US012707801B2

(12) United States Patent
Kwak et al.

(10) Patent No.: US 12,707,801 B2
(45) Date of Patent: Aug. 11, 2026

800

(54) LIGHT-EMITTING DEVICE AND ELECTRONIC APPARATUS INCLUDING SAME

(71) Applicant: Samsung Electronics Co., Ltd., Suwon-si (KR)

(72) Inventors: Seungyeon Kwak, Suwon-si (KR); Hyungjun Kim, Suwon-si (KR); Myungsun Sim, Suwon-si (KR); Kum Hee Lee, Suwon-si (KR); Sunghun Lee, Hwaseong-si (KR); Byoungki Choi, Hwaseong-si (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 1148 days.

(21) Appl. No.: 17/690,268

(22) Filed: Mar. 9, 2022

(65) Prior Publication Data

US 2023/0085905 A1 Mar. 23, 2023

(30) Foreign Application Priority Data

Mar. 10, 2021 (KR) ........................ 10-2021-0031483

(51) Int. Cl.
*H10K 50/165* (2023.01)
*H10K 50/11* (2023.01)
(Continued)

(52) U.S. Cl.
CPC ........... *H10K 50/165* (2023.02); *H10K 50/11* (2023.02); *H10K 50/155* (2023.02); *H10K 85/615* (2023.02); *H10K 2101/40* (2023.02)

(58) Field of Classification Search
CPC ........................... H10K 50/13; H10K 2101/90
See application file for complete search history.

(56) References Cited

U.S. PATENT DOCUMENTS 9,184,405 B2 11/2015 Song et al.
9,299,944 B2 3/2016 Seo et al.
(Continued)

FOREIGN PATENT DOCUMENTS

EP 3032600 A2 6/2016
EP 4002509 A1 5/2022
(Continued)

OTHER PUBLICATIONS

Office Action dated Nov. 21, 2021, issued in KR Patent Application No. 10-2021-0031483, 6 pp.
(Continued)

*Primary Examiner* — Sean M DeGuire
(74) *Attorney, Agent, or Firm* — CANTOR COLBURN LLP

(57) ABSTRACT

Provided are a light-emitting device and an electronic apparatus including the light-emitting device. The light-emitting device may include: an emission layer between a first electrode and a second electrode. The emission layer may include i) a first emission layer and ii) a second emission layer between the first emission layer and the second electrode, the first emission layer may be in direct contact with the second emission layer, the first emission layer may include a first dopant, a first hole-transporting compound, and a first electron-transporting compound, the second emission layer may include a second dopant, a second hole-transporting compound, and a second electron-transporting compound, the first dopant may be identical to the second dopant, and the first electron-transporting compound may be different from the second electron-transporting compound, electron mobility of the second electron-transporting compound may be greater than electron mobility of the first electron-transporting compound.

18 Claims, 2 Drawing Sheets

(51) Int. Cl.

| | |
|---|---|
| ***H10K 50/155*** | (2023.01) |
| ***H10K 85/60*** | (2023.01) |
| ***H10K 101/40*** | (2023.01) |

(56) References Cited

U.S. PATENT DOCUMENTS

| | | | | |
|---|---|---|---|---|
| 10,290,826 | B2 | 5/2019 | Kim et al. | |
| 2014/0070196 | A1 | 3/2014 | Kim et al. | |
| 2019/0006590 | A1 | 1/2019 | Park et al. | |
| 2019/0296090 | A1* | 9/2019 | Jang | H10K 59/32 |
| 2020/0274087 | A1* | 8/2020 | Lee | H10K 50/15 |
| 2021/0159282 | A1 | 5/2021 | Jang et al. | |
| 2022/0077414 | A1 | 3/2022 | Lee et al. | |

FOREIGN PATENT DOCUMENTS

| | | | |
|---|---|---|---|
| KR | 101108156 | B1 | 1/2012 |
| KR | 1020140059713 | A | 5/2014 |
| KR | 1020160069625 | A | 6/2016 |
| KR | 1020170031362 | A | 3/2017 |
| KR | 101744248 | B1 | 6/2017 |
| KR | 20190135964 | A | 12/2019 |
| KR | 1020200017985 | B1 | 2/2020 |
| KR | 102089329 | B1 | 3/2020 |
| KR | 20200103235 | A | 9/2020 |
| KR | 1020220017258 | A | 2/2022 |
| KR | 1020220069829 | A | 5/2022 |

OTHER PUBLICATIONS

English Translation of Office Action dated Nov. 21, 2021, issued in KR Patent Application No. 10-2021-0031483, 5 pp.

Extended European Search Report dated Jul. 1, 2022 issued in EP Patent Application No. 22160561.1, 9 pp.

Harvey Scher and Elliott W. Montroll. Anomalous transit-time dispersion in amorphous solids, Phys. Rev. B 12, 2455 (1975), 23 pp.

* cited by examiner

LIGHT-EMITTING DEVICE AND ELECTRONIC APPARATUS INCLUDING SAME

CROSS-REFERENCE TO RELATED APPLICATION

This application is based on and claims priority under 35 U.S.C. § 119 to Korean Patent Application No. 10-2021-0031483, filed on Mar. 10, 2021, in the Korean Intellectual Property Office, the disclosure of which is incorporated by reference herein in its entirety.

BACKGROUND

1. Field

Provided are a light-emitting device and an electronic apparatus including the same.

2. Description of the Related Art

Organic light-emitting devices (OLEDs), from among light-emitting devices, are self-emissive devices which produce full-color images. In addition, OLEDs have wide viewing angles and exhibit excellent driving voltage and response speed characteristics.

OLEDs include an anode, a cathode, and an organic layer between the anode and the cathode and including an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. The excitons may transition from an excited state to a ground state, thus generating light.

SUMMARY

The present disclosure relates to a light-emitting device including a novel emission layer and an electronic apparatus including the light-emitting device.

Additional aspects will be set forth in part in the description which follows and, in part, will be apparent from the description, or may be learned by practice of the presented embodiments of the disclosure.

According to an aspect of an embodiment, an organic light-emitting device includes a first electrode, a second electrode facing the first electrode, and an emission layer between the first electrode and the second electrode, wherein the emission layer includes i) a first emission layer and ii) a second emission layer between the first emission layer and the second electrode, the first emission layer may be in direct contact with the second emission layer, the first emission layer includes a first dopant, a first hole-transporting compound, and a first electron-transporting compound, the second emission layer includes a second dopant, a second hole-transporting compound, and a second electron-transporting compound, the first dopant is identical to the second dopant, the first electron-transporting compound is different from the second electron-transporting compound, the electron mobility of the second electron-transporting compound is greater than electron mobility of the first electron-transporting compound, and the electron mobility of the first electron-transporting compound and the electron mobility of the second electron-transporting compound may respectively be evaluated by using a time versus current graph of a time of flight (TOF) device including the first electron-transporting compound or the second electron-transporting compound.

According to an aspect of another embodiment, an electronic apparatus may include the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
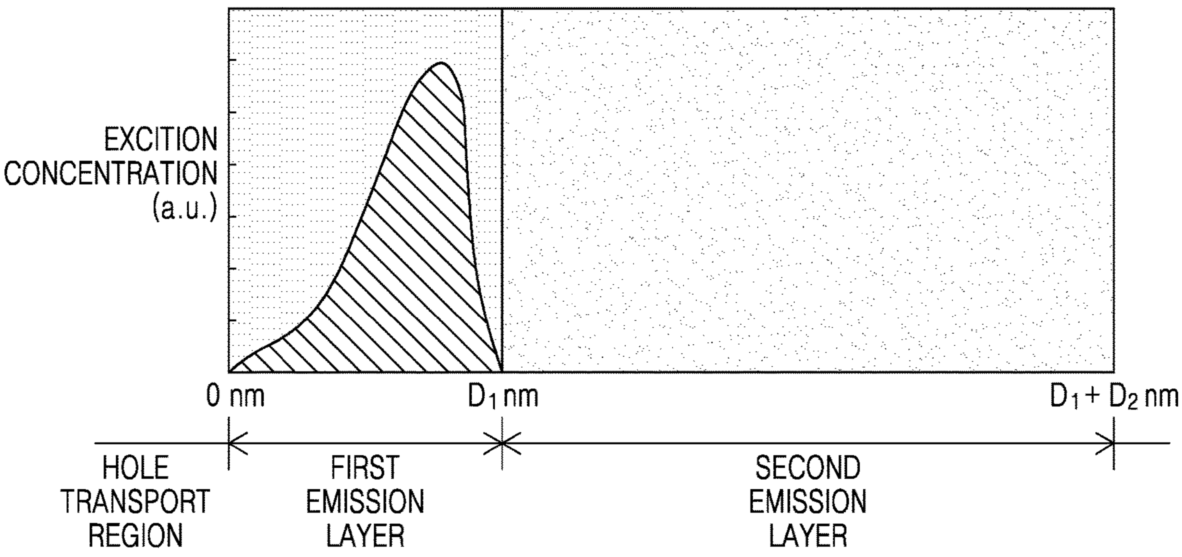
FIG. 1 is a graph of thickness of an emission layer (x-axis) versus an exciton concentration profile (y-axis) in an exemplary embodiment of a light-emitting device.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The light-emitting device may include: a first electrode; a second electrode facing the first electrode; and an emission layer between the first electrode and the second electrode, wherein the emission layer may include i) a first emission layer and ii) a second emission layer between the first emission layer and the second electrode.

The first emission layer may be in direct contact with the second emission layer.

The first emission layer may include a first dopant, a first hole-transporting compound, and a first electron-transporting compound, and the second emission layer may include a second dopant, a second hole-transporting compound, and a second electron-transporting compound.

The first dopant, the first hole-transporting compound, and the first electron-transporting compound included in the first emission layer may be different from each other.

The second dopant, the second hole-transporting compound, and the second electron-transporting compound included in the second emission layer may be different from each other.

A total weight of the first hole-transporting compound and the first electron-transporting compound in the first emission layer may be greater than a weight of the first dopant in the first emission layer.

In an embodiment, the first emission layer may include a dopant and a host (for example, a weight of the host may be greater than a weight of the dopant in the first emission layer), the dopant may include the first dopant, and the host may include the first hole-transporting compound and the first electron-transporting compound.

A total weight of the second hole-transporting compound and the second electron-transporting compound in the second emission layer may be greater than a weight of the second dopant in the second emission layer.

In an embodiment, the second emission layer may include a dopant and a host (for example, a weight of the host may be greater than a weight of the dopant in the second emission layer), the dopant may include the second dopant, and the host may include the second hole-transporting compound and the second electron-transporting compound.

In one or more embodiments, the first emission layer may include a mixture including the first dopant, the first hole-transporting compound, and the first electron-transporting compound. In one or more embodiments, the first emission layer may include a single layer including a mixture including the first dopant, the first hole-transporting compound, and the first electron-transporting compound. In one or more embodiments, the first emission layer may be formed by co-deposition of the first dopant, the first hole-transporting compound, and the first electron-transporting compound.

In one or more embodiments, the second emission layer may include a mixture including the second dopant, the second hole-transporting compound, and the second electron-transporting compound. In one or more embodiments, the second emission layer may include a single layer including a mixture including the second dopant, the second hole-transporting compound, and the second electron-transporting compound. In one or more embodiments, the second emission layer may be formed by co-deposition of second dopant, the second hole-transporting compound, and the second electron-transporting compound.

The first dopant included in the first emission layer may be identical to the second dopant included in the second emission layer. The first dopant and the second dopant may respectively be understood by referring to the descriptions of the first dopant and the second dopant provided herein.

In an embodiment, the first dopant and the second dopant may each be a phosphorescent dopant.

In one or more embodiments, the first dopant and the second dopant may each be a transition metal-containing organometallic compound.

In one or more embodiments, the first dopant and the second dopant may each be a heteroleptic transition metal-containing organometallic compound.

In one or more embodiments, the first dopant and the second dopant may each be an organometallic compound represented by Formula 1. Formula 1 may be understood by referring to the description of Formula 1 provided herein.

In one or more embodiments, the first dopant and the second dopant may each be a transition metal-containing organometallic compound, and the transition metal-containing organometallic compound may include a pyridine group, a benzimidazole group (or a naphthoimidazole group), and/or a dibenzofuran group (or an azadibenzofuran group, a dibenzothiophene group, or an azadibenzothiophene group). The pyridine group and the benzimidazole group (or the naphthoimidazole group) may each be bound to the transition metal of the transition metal-containing organometallic compound via a nitrogen atom, and the dibenzofuran group (or the azadibenzofuran group, the dibenzothiophene group, or the azadibenzothiophene group) may each be bound to the transition metal of the transition metal-containing organometallic compound via a carbon atom. The pyridine group, the benzimidazole group (or the naphthoimidazole group), and the dibenzofuran group (or the azadibenzofuran group, the dibenzothiophene group, or the azadibenzothiophene group) may optionally be substituted with at least one $R_1$. $R_1$ may be understood by referring to the description of $R_1$ in Formula 1.

In one or more embodiments, the first dopant and the second dopant may each be a transition metal-containing organometallic compound, and the transition metal-containing organometallic compound may include a pyridine group, a benzimidazole group (or a naphthoimidazole group), a benzene group, and/or a dibenzofuran group (or an azadibenzofuran group, a dibenzothiophene group, or an azadibenzothiophene group). The pyridine group and the benzimidazole group (or the naphthoimidazole group) may each be bound to the transition metal of the transition metal-containing organometallic compound via a nitrogen atom, and the benzene group and the dibenzofuran group (or the azadibenzofuran group, the dibenzothiophene group, or the azadibenzothiophene group) may each be bound to the transition metal of the transition metal-containing organometallic compound via a carbon atom. The pyridine group, the benzimidazole group (or the naphthoimidazole group), the benzene group, and the dibenzofuran group (or the azadibenzofuran group, the dibenzothiophene group, or the azadibenzothiophene group) may optionally be substituted with at least one $R_1$. $R_1$ may be understood by referring to the description of $R_1$ in Formula 1.

In one or more embodiments, the first dopant and the second dopant may each be a transition metal-containing organometallic compound, and the transition metal-containing organometallic compound may include a group represented by $—Si(Q_3)(Q_4)(Q_5)$, a group represented by $—Ge(Q_3)(Q_4)(Q_5)$, or any combination thereof. The $—Si(Q_3)(Q_4)(Q_5)$ group and the $—Ge(Q_3)(Q_4)(Q_5)$ group may respectively be understood by referring to the descriptions of $—Si(Q_3)(Q_4)(Q_5)$ and $—Ge(Q_3)(Q_4)(Q_5)$ in Formula 1.

In one or more embodiments, an absolute value of a highest occupied molecular orbital (HOMO) energy level of each of the first dopant and the second dopant may be smaller than each of an absolute value of a HOMO energy level of the first hole-transporting compound, an absolute value of a HOMO energy level of the second hole-transporting compound, an absolute value of a HOMO energy level of the first electron-transporting compound, and an absolute value of a HOMO energy level of the second electron-transporting compound. For example, the HOMO energy level may be a negative value as an actual measurement value measured by using a photoelectron spectrometer in an atmospheric pressure.

In one or more embodiments, a HOMO energy level of the first dopant and the second dopant may be in a range of about −5.60 eV to about −5.20 eV.

In an embodiment, the first hole-transporting compound included in the first emission layer may be identical to the second hole-transporting compound included in the second emission layer.

In one or more embodiments, the first hole-transporting compound included in the first emission layer may be different from the second hole-transporting compound included in the second emission layer.

The first hole-transporting compound and the second hole-transporting compound may respectively be understood by referring to the descriptions of the first hole-transporting compound and the second hole-transporting compound provided herein.

The first hole-transporting compound and the second hole-transporting compound may each be a compound i) including at least one π electron-rich $C_3$-$C_{60}$ cyclic group (e.g., a carbazole group, an indolocarbazole group, or a benzene group) and ii) not including an electron-transporting group. Examples of the electron-transporting group may include a cyano group, a fluoro group, a π electron-depleted nitrogen-containing $C_1$-$C_{60}$ cyclic group, a phosphine oxide group, and a sulfoxide group.

In an embodiment, the first hole-transporting compound and the second hole-transporting compound may each be a compound represented by Formula 5. Formula 5 may be understood by referring to the description of Formula 5 provided herein.

In an embodiment, the first electron-transporting compound included in the first emission layer may be different from the second electron-transporting compound included in the second emission layer.

For example, the first electron-transporting compound and the second electron-transporting compound may each be a compound including at least one electron-transporting group. The electron-transporting group may be a cyano group, a fluoro group, a π electron-depleted nitrogen-containing $C_1$-$C_{60}$ cyclic group, a phosphine oxide group, a sulfoxide group, or any combination thereof.

In an embodiment, the first electron-transporting compound and the second electron-transporting compound may each be a compound represented by Formula 7. Formula 7 may be understood by referring to the description of Formula 7 provided herein.

The electron mobility of the second electron-transporting compound may be greater than the electron mobility of the first electron-transporting compound.

The electron mobility of the first electron-transporting compound and the electron mobility of the second electron-transporting compound may respectively be evaluated by using a time versus current graph of a time of flight (TOF) device including the first electron-transporting compound or the second electron-transporting compound.

In an embodiment, the TOF device may include a pair of electrodes and a first film between the pair of electrodes, and the first film may consist of the first electron-transporting compound or the second electron-transporting compound.

The pair of electrodes may be a pair of conductive electrodes. For example, the pair of electrodes may be an indium tin oxide (ITO) electrode and an aluminum (Al) electrode, an ITO electrode and a silver (Ag) electrode, or an ITO electrode and a magnesium (Mg) electrode.

The first film may be formed by deposition. A thickness of the first film may be, for example, about 0.1 micrometers (μm) to about 5 μm.

The electron mobility of the first electron-transporting compound and the electron mobility of the second electron-transporting compound may each be calculated according to Equation 100:

$$\mu = \frac{d^2}{tV} \quad \text{Equation 100}$$

wherein, in Equation 100,

μ indicates the electron mobility of a compound of which electron mobility is measured, d indicates the thickness of a film including the compound of which electron mobility is measured (that is, the first film of the TOF device), t indicates the electron migration time evaluated from a time versus current graph of the TOF device including the compound of which electron mobility is measured, and V indicates the voltage applied to the TOF device including the compound of which electron mobility is measured.

In an embodiment, in Equation 100, "t" may be the time corresponding to the intersection point of two tangent lines in the time versus current graph (e.g., a log-log scale) of the TOF device (e.g., the tangent line in FIG. 3) (e.g., Harvey Scher and Elliott W. Montroll. Phys. Rev. B 12, 2455 (1975)).

For example, a method of evaluating the electron mobility may be understood by referring to the description of Evaluation Example 1 provided herein.

In an embodiment, the electron mobility of the second electron-transporting compound may be about 110% or greater, about 110% to about 1,000%, about 110% to about 500%, about 110% to about 300%, about 110% to about 200%, about 130% to about 210%, about 150% to about 220%, about 170% to about 230%, about 180% to about 240%, or about 190% to about 250% of the electron mobility of the first electron-transporting compound.

In one or more embodiments, the electron mobility of the second electron-transporting compound may be about $2.0\times10^{-5}$ $cm^2/Vs$ or greater, or for example, about $2.0\times10^{-5}$ $cm^2/Vs$ to about $5.0\times10^{-5}$ $cm^2/Vs$, about $2.2\times10^{-5}$ $cm^2/Vs$ to about $4.5\times10^{-5}$ $cm^2/Vs$, about $2.4\times10^{-5}$ $cm^2/Vs$ to about $4.0\times10^{-5}$ $cm^2/Vs$, about $2.6\times10^{-5}$ $cm^2/Vs$ to about $3.0\times10^{-5}$ $cm^2/Vs$, or about $2.8\times10^{-5}$ $cm^2/Vs$ to about $3.2\times10^{-5}$ $cm^2/Vs$.

In one or more embodiments, the electron mobility of the first electron-transporting compound may be less than about $2.8\times10^{-5}$ $cm^2/Vs$, or for example, about $1.0\times10^{-5}$ $cm^2/Vs$ to about $2.7\times10^{-5}$ $cm^2/Vs$, about $1.1\times10^{-5}$ $cm^2/Vs$ to about $2.2\times10^{-5}$ $cm^2/Vs$, about $1.2\times10^{-5}$ $cm^2/Vs$ to about $1.8\times10^{-5}$ $cm^2/Vs$, or about $1.3\times10^{-5}$ $cm^2/Vs$ to about $1.6\times10^{-5}$ $cm^2/Vs$.

In one or more embodiments, the electron mobility of the first electron-transporting compound may be about $2.0\times10^{-5}$ $cm^2/Vs$ or less, or for example, about $1.8\times10^{-5}$ $cm^2/Vs$ or less, about $1.0\times10^{-5}$ $cm^2/Vs$ to about $2.0\times10^{-5}$ $cm^2/Vs$, or about $1.2\times10^{-5}$ $cm^2/Vs$ to about $1.6\times10^{-5}$ $cm^2/Vs$.

As described above, when the electron mobility of the second electron-transporting compound is greater than the electron mobility of the first electron-transporting compound, resistance may not be generated between the first hole-transporting compound and the second hole-transporting compound, and resistance of the light-emitting device may be reduced due to the second electron-transporting compound (having relatively high electron mobility), thereby improving the driving voltage of the light-emitting device. In addition, an exciton recombination zone in the emission layer may have a relatively narrow width, and thus, an exciton recombination rate in the emission layer may increase, thereby improving luminescence efficiency of the light-emitting device. At the same time, due to the first electron-transporting compound (having relatively low electron mobility), the exciton recombination zone may be spaced apart from the interface between the hole transport region and the emission layer by a predetermined distance, thereby improving lifespan characteristics of the light-emitting device. Accordingly, the driving voltage of the light-emitting device including the emission layer may be reduced, and thus, luminescence efficiency and lifespan characteristics of the light-emitting device may be increased.

FIG. 1 is a graph of thickness of an emission layer (x-axis) versus an exciton concentration profile (y-axis) in a light-emitting device. The hatched area indicates the exciton recombination zone.

The x-axis in FIG. 1 indicates the thickness of the emission layer, and when i) the light-emitting device further includes a hole transport region between the first electrode and the emission layer and an electron transport region between the emission layer and the second electrode, ii) a thickness of the first emission layer is $D_1$ nanometers (nm), and iii) a thickness of the second emission layer is $D_2$ nm, the interface between the hole transport region and the first emission layer in the x-axis in FIG. 1 may be at 0 nm, and the interface between the second emission layer and the electron transport region may be at $D_1+D_2$ nm.

In an embodiment, the light-emitting device may satisfy at least one of Conditions 1 to 3, and Conditions 1 to 3 may be understood by referring to FIG. 1:

Condition 1

70% or greater of the exciton recombination zone may be formed in the first emission layer of the emission layer, Condition 2 the full width at half maximum (FWHM) of the exciton concentration profile in the emission layer may be $0.1\times D_1$ nm to $0.7\times D_1$ nm, and $D_1$ may be the thickness of the first emission layer, and Condition 3 a hole transport region may be between the first electrode and the emission layer, and a maximum value of the exciton concentration in the emission layer may be present in an area of $0.5\times D_1$ nm to $D_1$ nm from the interface between the hole transport region and the emission layer to inside the emission layer, and $D_1$ indicates thickness of the first emission layer.

In one or more embodiments, the light-emitting device may satisfy Equation 1:

$$\mathrm{Con(HT1)} > \mathrm{Con(ET1)} \quad \text{Equation 1}$$

wherein, in Equation 1,

Con(HT1) indicates the parts by weight of the first hole-transporting compound, based on 100 parts by weight of the total weight of the first dopant, the first hole-transporting compound, and the first electron-transporting compound, and Con(ET1) indicates the parts by weight of the first electron-transporting compound, based on 100 parts by weight of the total weight of the first dopant, the first hole-transporting compound, and the first electron-transporting compound.

In one or more embodiments, a ratio of Con(HT1) to Con(ET1) may be in a range of about 8:2 to about 5.2:4.8.

In one or more embodiments, the light-emitting device may satisfy Equation 2:

$$\mathrm{Con(HT2)} > \mathrm{Con(ET2)} \quad \text{Equation 2}$$

wherein, in Equation 2,

Con(HT2) indicates the parts by weight of the second hole-transporting compound, based on 100 parts by weight of the total weight of the second dopant, the second hole-transporting compound, and the second electron-transporting compound, and Con(ET2) indicates the parts by weight of the second electron-transporting compound, based on 100 parts by weight of the total weight of the second dopant, the second hole-transporting compound, and the second electron-transporting compound.

In one or more embodiments, a ratio of Con(HT2) to Con(ET2) may be in a range of about 8:2 to about 5.2:4.8.

In one or more embodiments, the light-emitting device may satisfy Equation 3:

$$\mathrm{Con(ET2)} > \mathrm{Con(ET1)} \quad \text{Equation 3}$$

wherein, in Equation 3,

Con(ET2) indicates the parts by weight of the second electron-transporting compound, based on 100 parts by weight of the total weight of the second dopant, the second hole-transporting compound, and the second electron-transporting compound, and Con(ET1) indicates the parts by weight of the first electron-transporting compound, based on 100 parts by weight of the total weight of the first dopant, the first hole-transporting compound, and the first electron-transporting compound.

In one or more embodiments, the light-emitting device may satisfy Equation 4:

$$\mathrm{Con(ET2)} < \mathrm{Con(ET1)} \quad \text{Equation 4}$$

wherein, in Equation 4,

Con(ET2) indicates the parts by weight of the second electron-transporting compound, based on 100 parts by weight of the total weight of the second dopant, the second hole-transporting compound, and the second electron-transporting compound, and Con(ET1) indicates the parts by weight of the first electron-transporting compound, based on 100 parts by weight of the total weight of the first dopant, the first hole-transporting compound, and the first electron-transporting compound.

In one or more embodiments, a ratio of a thickness of the second emission layer to a thickness of the first emission layer may be in a range of about 9:1 to about 1:9, or for example, about 2:8 to about 8:2.

In one or more embodiments, light which may be emitted from the emission layer and passed through at least one of the first electrode and the second electrode to the outside of the device may not be white light.

In one or more embodiments, light which may be emitted from the emission layer and passed through at least one of the first electrode and the second electrode to the outside of the device may be green light having a maximum emission wavelength (emission peak wavelength) in a range of about 500 nm to about 580 nm.

In one or more embodiments, the light-emitting device may further include a hole transport region between the first electrode and the emission layer, wherein the hole transport region may not include a charge-generation layer and an emission layer. The hole transport region may include a hole injection layer, a hole transport layer, an electron blocking layer, a buffer layer, or a combination thereof.

In one or more embodiments, the light-emitting device may further include an electron transport region between the emission layer and the second electrode, wherein the electron transport region may not include a charge-generation layer and an emission layer. The electron transport region may include a hole blocking layer, an electron transport layer, an electron injection layer, or a combination thereof.

In one or more embodiments, the emission layer may not include a compound of Group A:

Group A

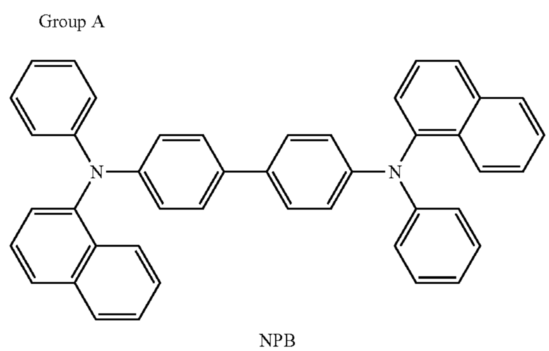

NPB

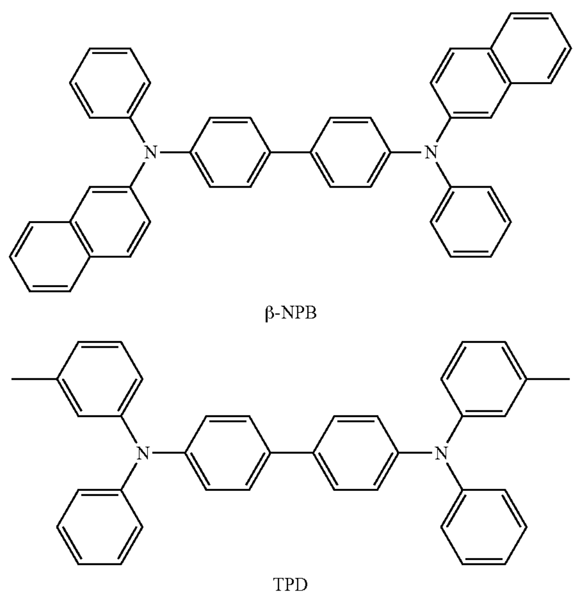

β-NPB

TPD

-continued
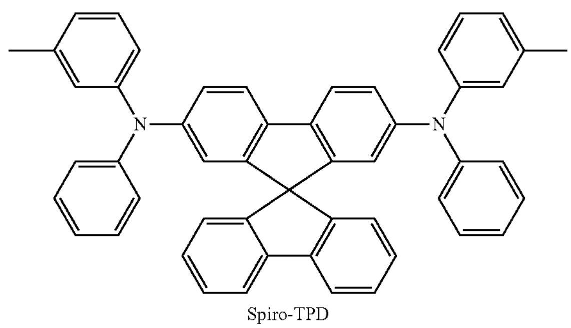
Spiro-TPD
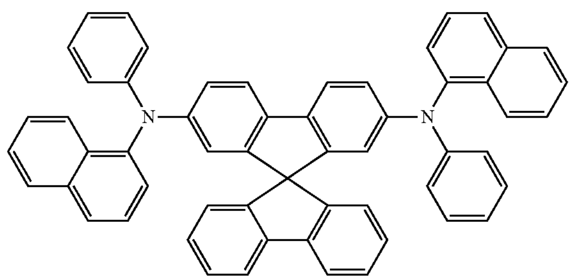
Spiro-NPB
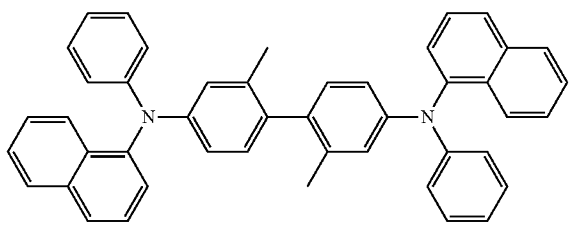
methylated NPB
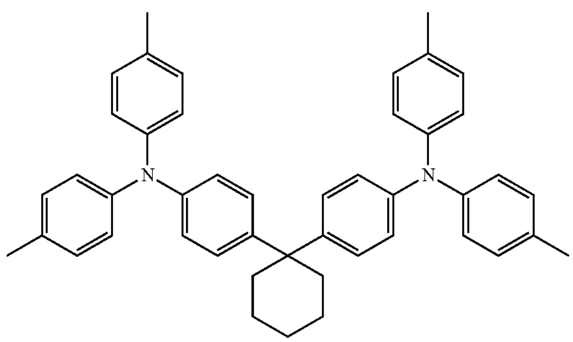
TAPC
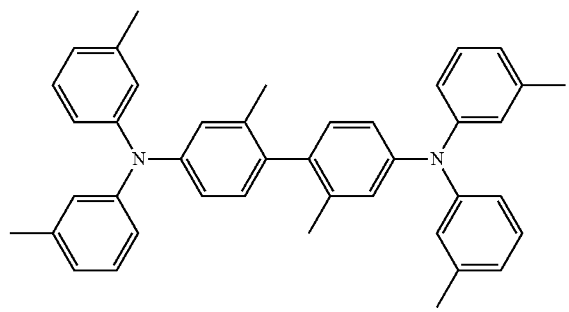
HMTPD
-continued
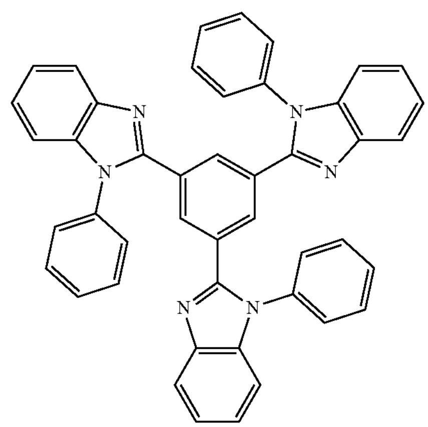
TPBi
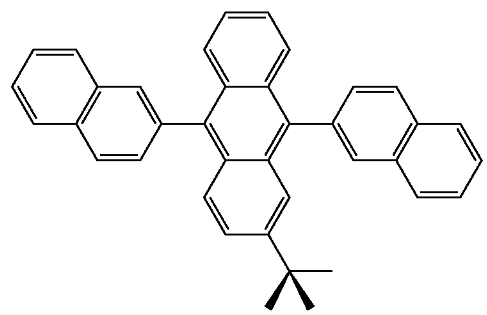
TBADN
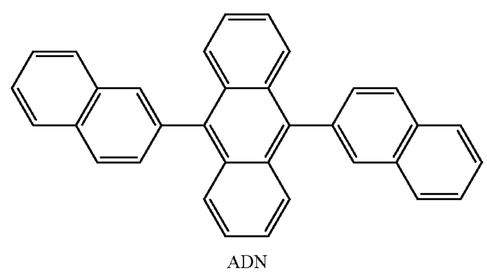
ADN
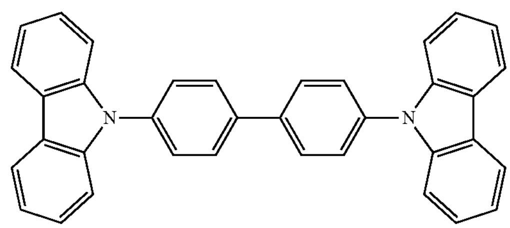
CBP
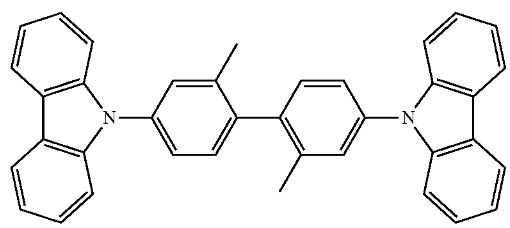
CDBP -continued
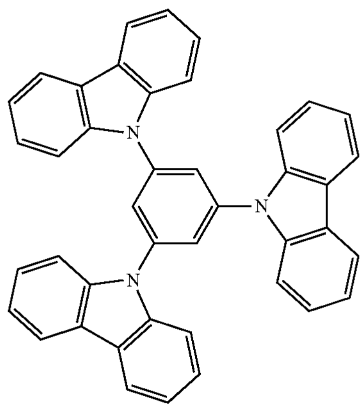
TCP
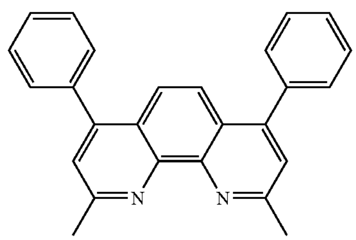
BCP
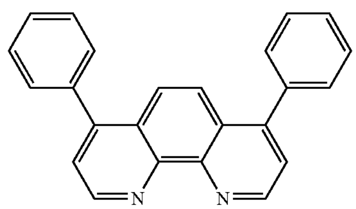
Bphen
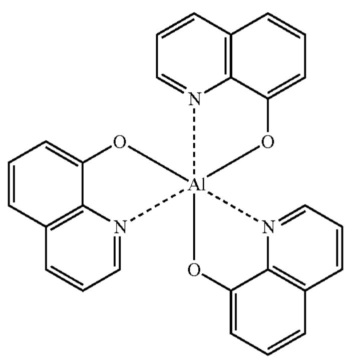
$Alq_3$
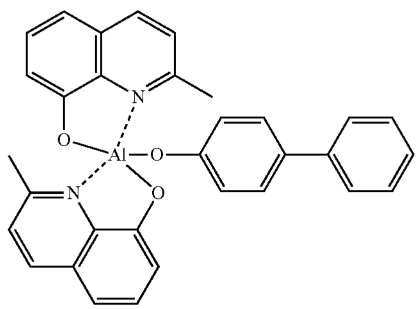
BAlq
-continued
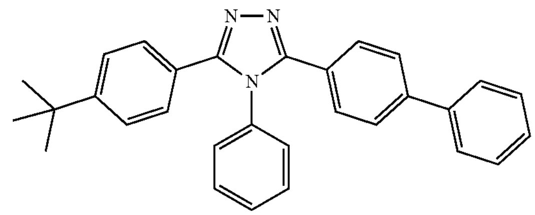
TAZ
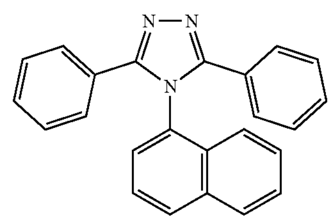
NTAZ
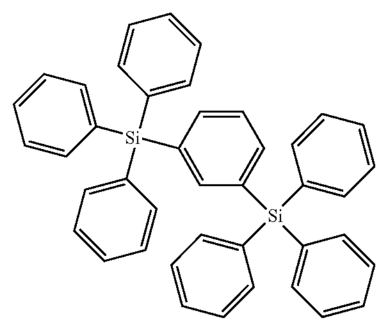
m-bis-(triphenylsilyl)benzene
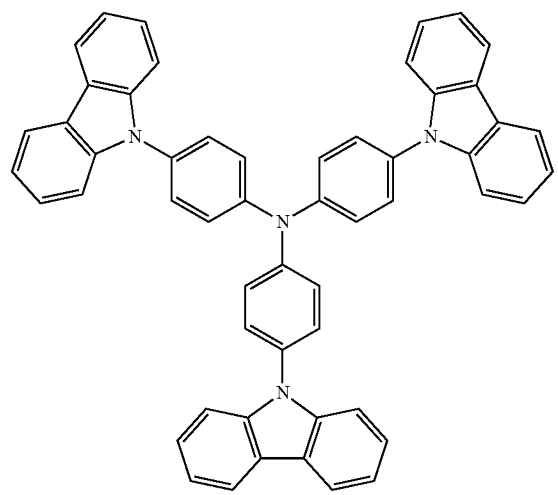
TCTA
(4,4′,4″-tris(carbazol-9-yl)triphenylamine)

-continued

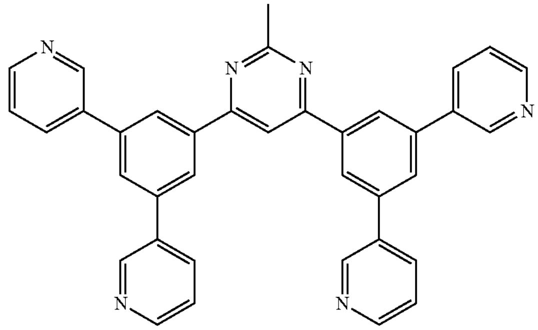

B3PYMPM
(4,6-bis(3,5-di(pyridine-3-yl)phenyl)-2-methylpyrimidine)

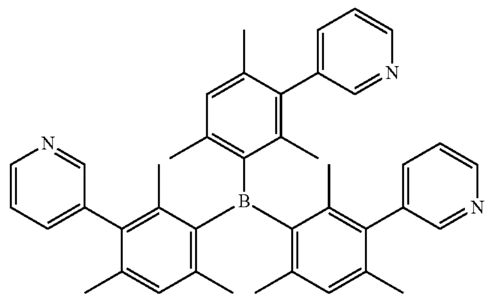

3TPYMB
(tris(2,4,6-trimethyl-3-(pyridine-3-yl)phenyl)borane)

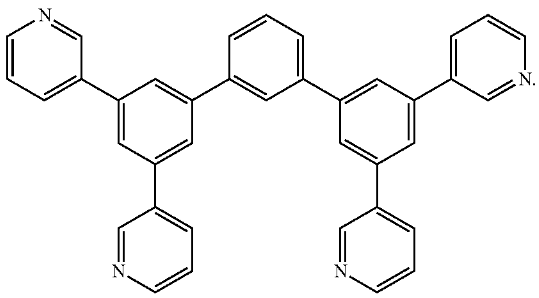

BmPyPhB
(1,3-bis[3,5-di(pyridine-3-yl)phenyl]benzene)

The first electrode may be an anode, which is a hole injection electrode, and the second electrode may be a cathode, which is an electron injection electrode. In some embodiments, the first electrode may be a cathode, which is an electron injection electrode, and the second electrode may be an anode, which is a hole injection electrode.

Description for Formula 1

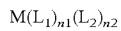

$M(L_1)_{n1}(L_2)_{n2}$ Formula 1

In Formula 1, M may be a transition metal.

In some embodiments, M may be a first-row transition metal, a second-row transition metal, or a third-row transition metal.

In some embodiments, M may be iridium (Ir), platinum (Pt), osmium (Os), titanium (Ti), zirconium (Zr), hafnium (Hf), europium (Eu), terbium (Tb), thulium (Tm), or rhodium (Rh).

In an embodiment, M may be Ir, Pt, Os, or Rh.

In Formula 1, $L_1$ may be a ligand represented by Formula 2A, and $L_2$ may be a ligand represented by Formula 2B:

Formula 2A

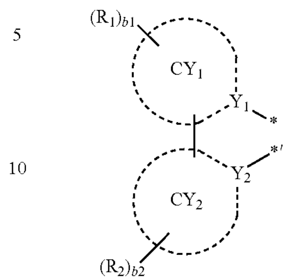

Formula 2B

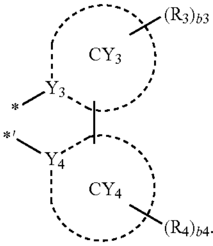

Formulae 2A and 2B may respectively be understood by referring to the descriptions of Formulae 2A and 2B provided herein.

n1 in Formula 1 may be 1, 2, or 3, and when n1 is 2 or greater, at least two $L_1$(s) may be identical to or different from each other.

In Formula 1, n2 may be 0, 1, or 2, and when n2 is 2, two $L_2$(s) may be identical to or different from each other.

In Formula 1, the sum of n1 and n2 may be 2 or 3. For example, a sum of n1 and n2 may be 3.

In some embodiments, in Formula 1, i) M may be Ir, and n1+n2=3, or ii) M may be Pt, and n1+n2=2.

In one or more embodiments, in Formula 1, M may be Ir, and i) n1 may be 1, and n2 may be 2, or ii) n1 may be 2, and n2 may be 1.

$L_1$ and $L_2$ in Formula 1 may be different from each other.

In Formulae 2A to 2B, $Y_1$ to $Y_4$ may each independently be C or N. For example, $Y_1$ and $Y_3$ may each be N, and $Y_2$ and $Y_4$ may each be C.

In Formulae 2A and 2B, ring $CY_1$ to ring $CY_4$ may each independently be a $C_5$-$C_{30}$ carbocyclic group or a $C_1$-$C_{30}$ heterocyclic group.

In some embodiments, ring $CY_1$ to ring $CY_4$ may each independently include i) a third ring, ii) a fourth ring, iii) a condensed ring in which at least two third rings are condensed, iv) a condensed ring in which at least two fourth rings are condensed, or v) a condensed ring in which at least one third ring is condensed with at least one fourth ring, the third ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the fourth ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In an embodiment, ring $CY_1$ to ring $CY_4$ may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluorene-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an isooxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzoisothiazole group, a benzoxadiazole group, a benzothiadiazole group, a pyridinopyrrole group, a pyridinopyrazole group, a pyridinoimidazole group, a pyridinooxazole group, a pyridinoisoxazole group, a pyridinothiazole group, a pyridinoisothiazole group, a pyridinooxadiazole group, a pyridinothiadiazole group, a pyrimidinopyrrole group, a pyrimidinopyrazole group, a pyrimidinoimidazole group, a pyrimidinooxazole group, a pyrimidinoisoxazole group, a pyrimidinothiazole group, a pyrimidinoisothiazole group, a pyrimidinooxadiazole group, a pyrimidinothiadiazole group, a 5,6,7,8-tetrahydroisoquinoline group, a 5,6,7,8-tetrahydroquinoline group, an adamantane group, a norbornane group, a norbornene group, a benzene group condensed with a cyclohexane group, a benzene group condensed with a norbornane group, a pyridine group condensed with a cyclohexane group, or a pyridine group condensed with a norbornane group.

In an embodiment, ring $CY_1$ may be an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an isooxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzoisothiazole group, a benzoxadiazole group, a benzothiadiazole group, a pyridinopyrrole group, a pyridinopyrazole group, a pyridinoimidazole group, a pyridinooxazole group, a pyridinoisoxazole group, a pyridinothiazole group, a pyridinoisothiazole group, a pyridinooxadiazole group, a pyridinothiadiazole group, a pyrimidinopyrrole group, a pyrimidinopyrazole group, a pyrimidinoimidazole group, a pyrimidinooxazole group, a pyrimidinoisoxazole group, a pyrimidinothiazole group, a pyrimidinoisothiazole group, a pyrimidinooxadiazole group, a pyrimidinothiadiazole group, a 5,6,7,8-tetrahydroisoquinoline group, a 5,6,7,8-tetrahydroquinoline group, a pyridine group condensed with a cyclohexane group, or a pyridine group condensed with a norbornane group.

In one or more embodiments, ring $CY_2$ and $CY_4$ may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluorene-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, an adamantane group, a norbornane group, a norbornene group, a benzene group condensed with a cyclohexane group, or a benzene group condensed with a norbornane group.

In one or more embodiments, ring $CY_3$ may be an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a 5,6,7,8-tetrahydroquinoline group, a pyridine group condensed with a cyclohexane group, or a pyridine group condensed with a norbornane group.

In one or more embodiments, ring $CY_1$ of Formula 2A may be a pyridine group, a benzimidazole group, a pyridinoimidazole group, or a pyrimidinoimidazole group.

In one or more embodiments, ring $CY_2$ in Formula 2A may be a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, or an azaphenanthrobenzoselenophene group.

In one or more embodiments, ring $CY_3$ of Formula 2B may be a pyridine group, a pyrimidine group, a pyrazine group, a pyridazine group, a triazine group, a 5,6,7,8-tetrahydroquinoline group, a pyridine group condensed with a cyclohexane group, or a pyridine group condensed with a norbornane group.

In one or more embodiments, ring $CY_4$ of Formula 2B may be a benzene group, a naphthalene group, an anthracene group, a phenanthrene group, a triphenylene group, a pyrene group, a chrysene group, a 1,2,3,4-tetrahydronaphthalene group, a benzene group condensed with a cyclohexane group, or a benzene group condensed with a norbornane group.

For example, in Formulae 2A and 2B, ring $CY_1$ may be different from ring $CY_3$.

For example, in Formulae 2A and 2B, ring $CY_2$ may be different from ring $CY_4$.

For example, in Formulae 2A and 2B, ring $CY_1$ to ring $CY_4$ may be different from each other.

In Formulae 2A and 2B, $R_1$ to $R_4$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$. $Q_1$ to $Q_9$ may respectively be understood by referring to the descriptions of $Q_1$ to $Q_9$ provided herein.

In an embodiment, in Formulae 2A and 2B, $R_1$ to $R_4$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl) phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a (phenyl)$C_1$-$C_{10}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, wherein $Q_1$ to $Q_9$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In one or more embodiments, $R_1$ to $R_4$ may each independently be:

hydrogen, deuterium, —F, or a cyano group;

a $C_1$-$C_{20}$ alkyl group unsubstituted or substituted with deuterium, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated heterocycloalkyl group, a fluorinated $C_1$-$C_{10}$ heterocycloalkyl group, a ($C_1$-$C_{20}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or any combination thereof;

a $C_3$-$C_{10}$ cycloalkyl group, a $C_1$-$C_{10}$ heterocycloalkyl group, a phenyl group, or a biphenyl group, each unsubstituted or substituted with deuterium, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or any combination thereof; or —$Si(Q_3)(Q_4)(Q_5)$ or —$Ge(Q_3)(Q_4)(Q_5)$.

In Formulae 2A and 2B, b1 to b4 may respectively indicate the number of $R_1$(s) to $R_4$(s), and b1 and b2 may each independently be an integer from 0 to 20. When b1 is 2 or greater, at least two $R_1$(s) may be identical to or different from each other, when b2 is 2 or greater, at least two $R_2$(s) may be identical to or different from each other, when b3 is 2 is or greater, at least two $R_3$(s) may be identical to or different from each other, and when b4 is 2 is or greater, at least two $R_4$(s) may be identical to or different from each other. In some embodiments, b1 to b4 may each independently be an integer from 0 to 8.

In an embodiment, n2 in Formula 1 may not be 0, b3 in Formula 2B may not be 0, and at least one of $R_3$(s) in the number of b3 may be —$Si(Q_3)(Q_4)(Q_5)$ or —$Ge(Q_3)(Q_4)(Q_5)$. $Q_3$ to $Q_5$ may respectively be understood by referring to the descriptions of $Q_3$ to $Q_5$ provided herein.

In some embodiments, $Q_3$ to $Q_5$ may each independently be:

a $C_1$-$C_{60}$ alkyl group unsubstituted or substituted with deuterium, a $C_1$-$C_{60}$ alkyl group, a $C_6$-$C_{60}$ aryl group, or any combination thereof; or a $C_1$-$C_{60}$ aryl group unsubstituted or substituted with deuterium, a $C_6$-$C_{60}$ alkyl group, a $C_6$-$C_{60}$ aryl group, or any combination thereof.

In some embodiments, $Q_3$ to $Q_5$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In an embodiment, $Q_3$ to $Q_5$ may be identical to one another.

In one or more embodiments, at least two of $Q_3$ to $Q_5$ may be different from one another.

In one or more embodiments, the organometallic compound represented by Formula 1 may include at least one deuterium.

In one or more embodiments, the organometallic compound represented by Formula 1 may satisfy at least one of Conditions (1) to (8):

Condition (1)

wherein, in Formula 2A, b1 may not be 0, and at least one of $R_1$(s) in the number of b1 may include deuterium, Condition (2)

wherein, in Formula 2A, b2 may not be 0, and at least one of $R_2$(s) in the number of b2 may include deuterium, Condition (3)

wherein, in Formula 2B, b3 may not be 0, and at least one of $R_3$(s) in the number of b3 may include deuterium, Condition (4)

wherein, in Formula 2B, b4 may not be 0, and at least one of $R_4$(s) in the number of b4 may include deuterium, Condition (5)

wherein, in Formula 2A, b1 may not be 0, and at least one of $R_1$(s) in the number of b1 may include a fluoro group, Condition (6)

wherein, in Formula 2A, b2 may not be 0, and at least one of $R_2$(s) in the number of b2 may include a fluoro group, Condition (7)

wherein, in Formula 2B, b3 may not be 0, and at least one of $R_3$(s) in the number of b3 may include a fluoro group, Condition (8)

wherein, in Formula 2B, b4 may not be 0, and at least one of $R_4$(s) in the number of b4 may include a fluoro group.

In one or more embodiments, in Formulae 2A and 2B, $R_1$ to $R_4$ may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, —$OCH_3$, —$OCDH_2$, —$OCD_2H$, —$OCD_3$, —$SCH_3$, —$SCDH_2$, —$SCD_2H$, —$SCD_3$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formulae 10-201 to 10-354, a group represented by one of Formulae 10-201 to 10-354 in which at least one hydrogen is substituted with deuterium, a group represented by one of Formulae 10-201 to 10-354 in which at least one hydrogen is substituted with —F, —$Si(Q_3)(Q_4)(Q_5)$, or —$Ge(Q_3)(Q_4)(Q_5)$, wherein $Q_3$ to $Q_5$ may respectively be understood by referring to the descriptions of $Q_3$ to $Q_5$ provided herein:

9-1

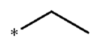

9-2

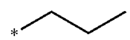

9-3

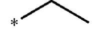

9-4

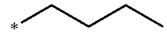

9-5

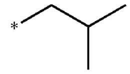

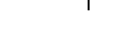

9-6

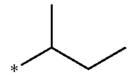

9-7

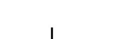

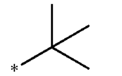

9-8

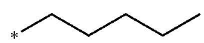

9-9

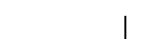

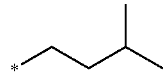

9-10

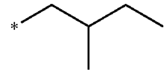

9-11

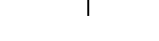

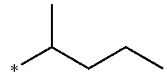

9-12

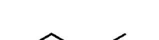

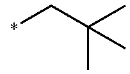

9-13

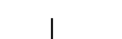

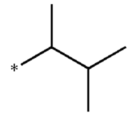

9-14

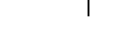

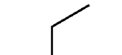

9-15

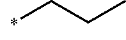

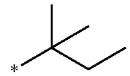

9-16

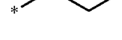

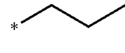

9-17

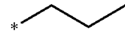

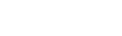

-continued
9-18
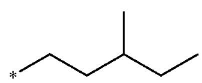
9-19
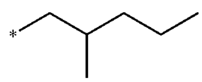
9-20
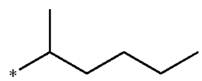
9-21
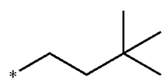
9-22
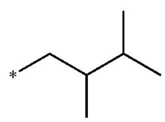
9-23
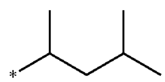
9-24
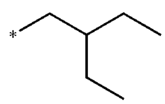
9-25
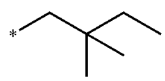
9-26
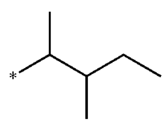
9-27
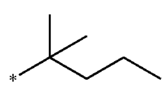
9-28
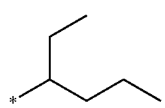
9-29
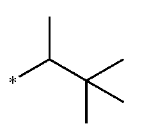
9-30
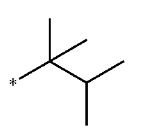
9-31
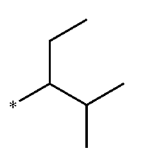
-continued
9-32
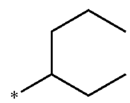
9-33
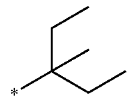
9-34
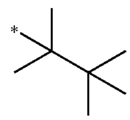
9-35
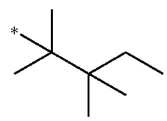
9-36
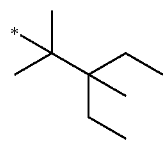
9-37
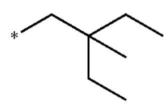
9-38
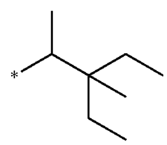
9-39
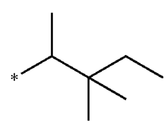
9-201
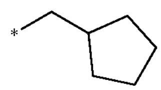
9-202
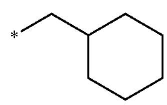
9-203
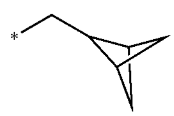
9-204
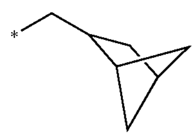
9-205
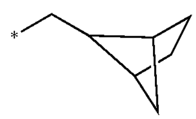

-continued
9-206
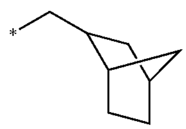
9-207
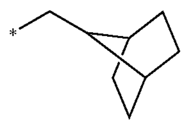
9-208
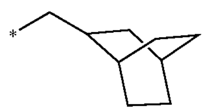
9-209
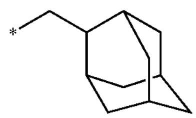
9-210
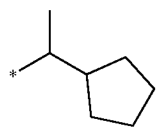
9-211
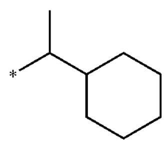
9-212
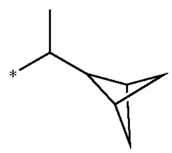
9-213
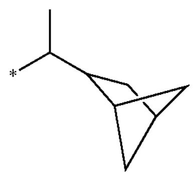
9-214
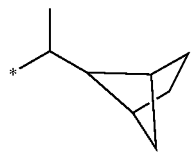
9-215
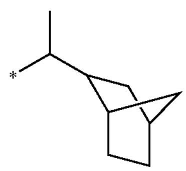
-continued
9-216
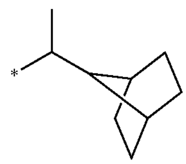
9-217
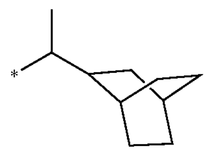
9-218
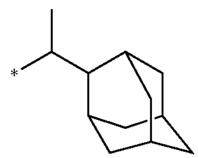
9-219
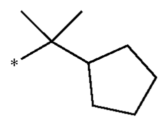
9-220
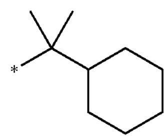
9-221
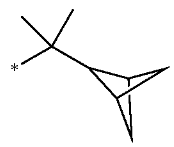
9-222
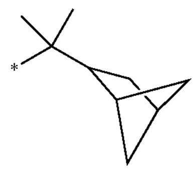
9-223
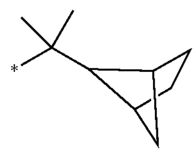
9-224
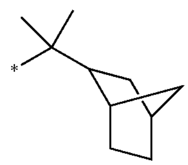
9-225
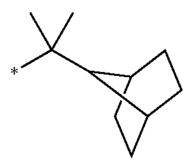

-continued
9-226
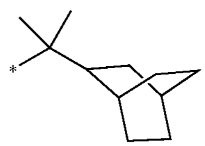
9-227
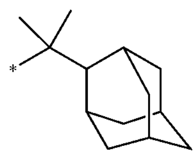
9-228
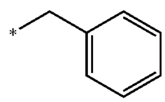
9-229
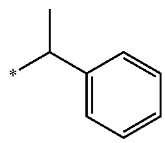
9-230
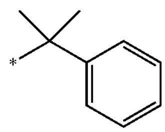
10-1
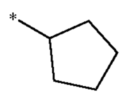
10-2
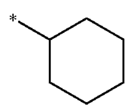
10-3
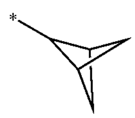
10-4
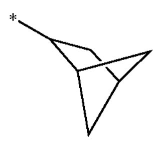
10-5
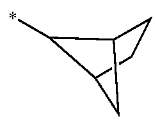
10-6
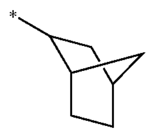
10-7
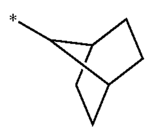
-continued
10-8
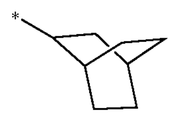
10-9
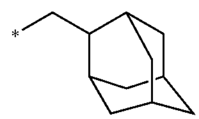
10-10
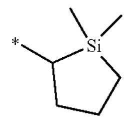
10-11
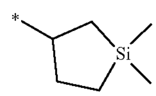
10-12
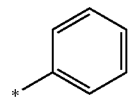
10-13
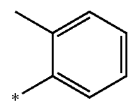
10-14
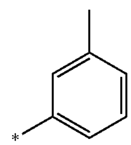
10-15
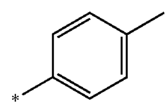
10-16
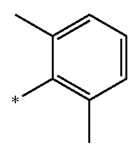
10-17
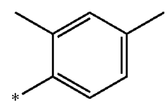
10-18
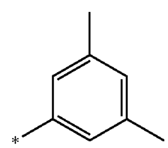
10-19
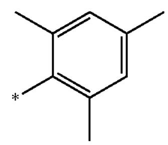

-continued
10-20
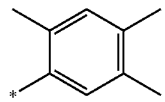
10-21
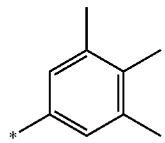
10-22
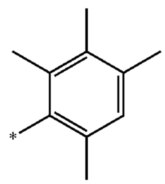
10-23
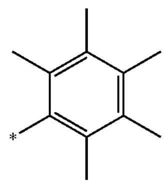
10-24
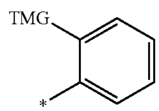
10-25
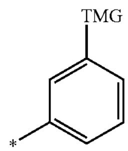
10-26
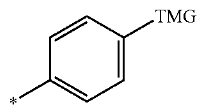
10-27
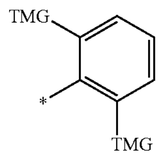
10-28
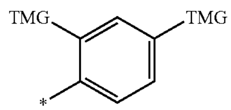
10-29
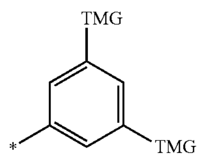
10-30
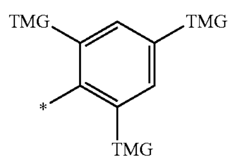
-continued
10-31
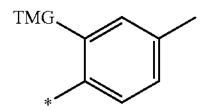
10-32
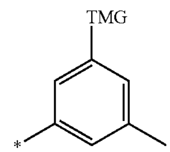
10-33
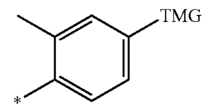
10-34
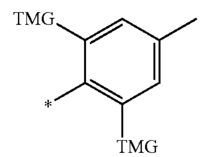
10-35
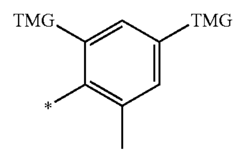
10-36
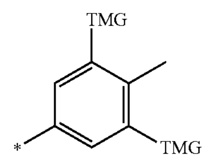
10-37
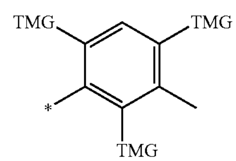
10-38
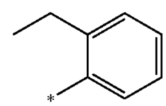
10-39
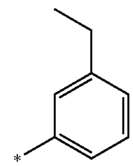
10-40
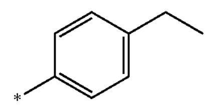
10-41
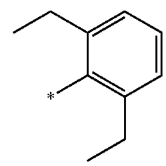

-continued
10-42
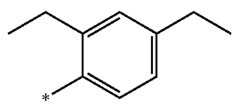
10-43
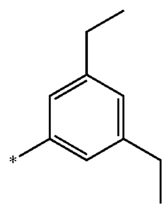
10-44
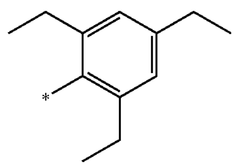
10-45
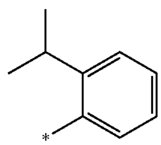
10-46
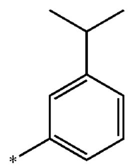
10-47
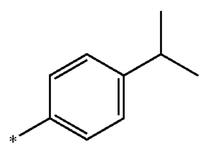
10-48
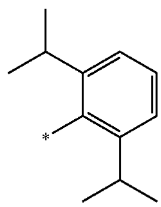
10-49
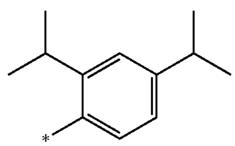
10-50
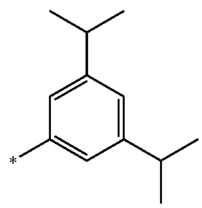
-continued
10-51
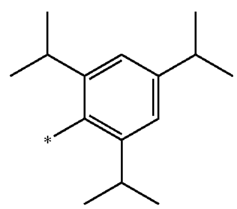
10-52
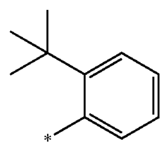
10-53
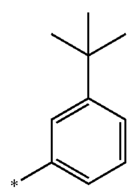
10-54
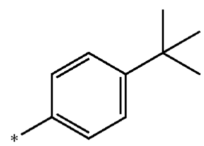
10-55
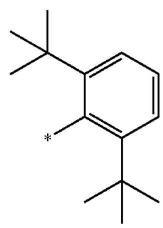
10-56
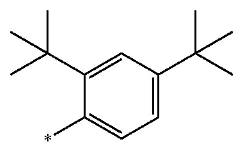
10-57
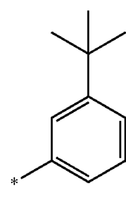
10-58
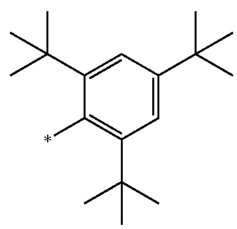

-continued
10-59
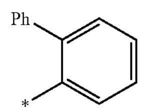
10-60
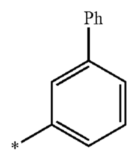
10-61
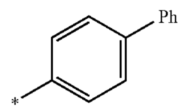
10-62
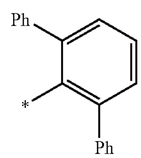
10-63
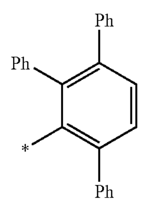
10-64
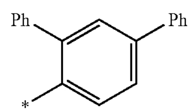
10-65
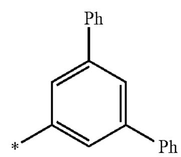
10-66
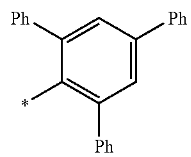
10-67
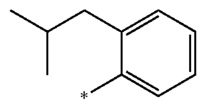
10-68
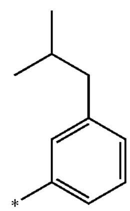
10-69
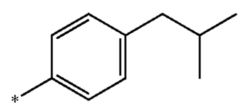
-continued
10-70
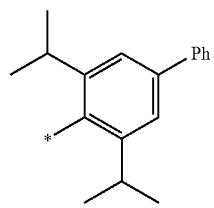
10-71
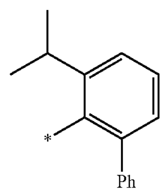
10-72
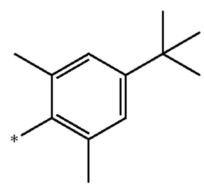
10-73
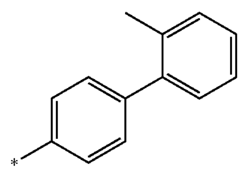
10-74
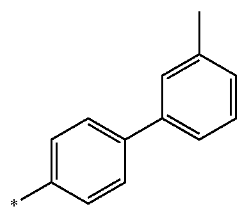
10-75
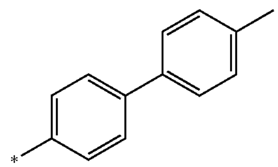
10-76
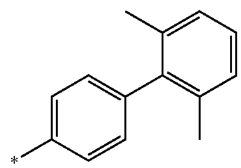
10-77
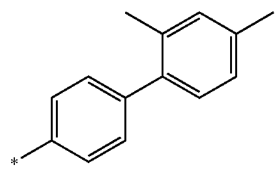

-continued
10-78
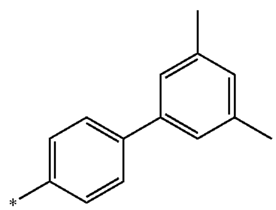
10-79
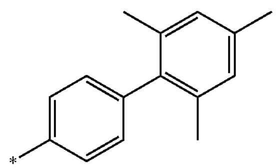
10-80
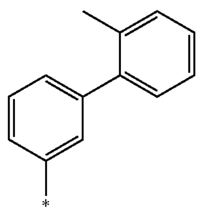
10-81
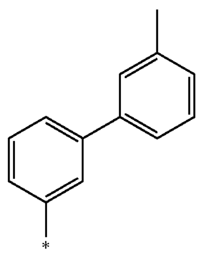
10-82
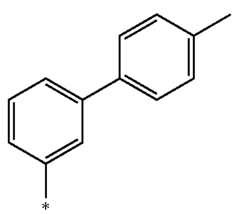
10-83
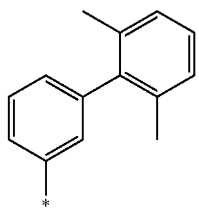
10-84
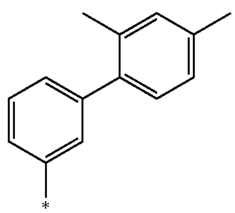
-continued
10-85
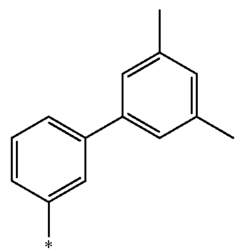
10-86
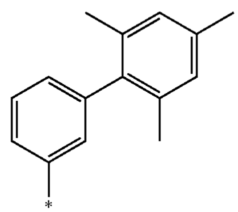
10-87
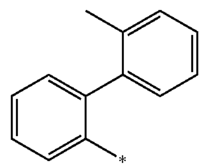
10-88
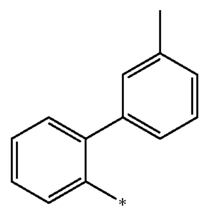
10-89
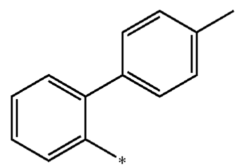
10-90
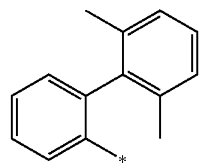
10-91
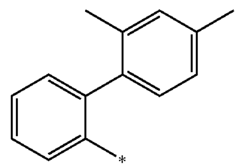
10-92
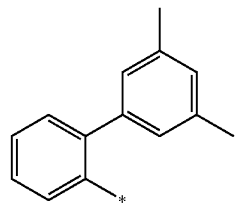

-continued
10-93
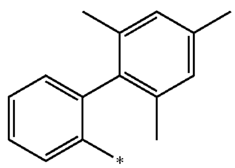
10-94
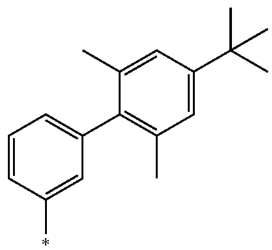
10-95
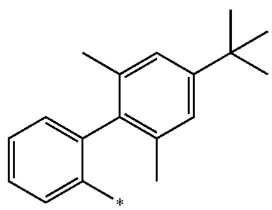
10-96
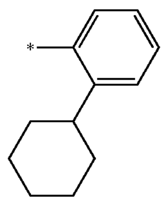
10-97
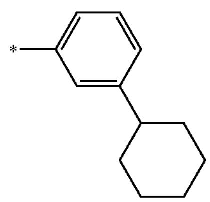
10-98
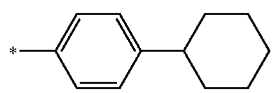
10-99
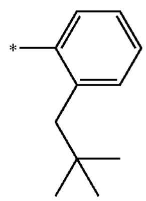
10-100
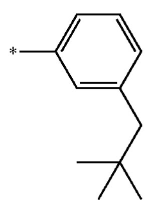
-continued
10-101
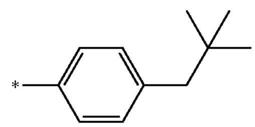
10-102
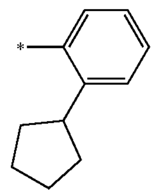
10-103
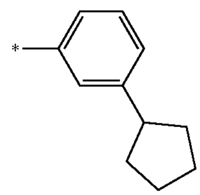
10-104
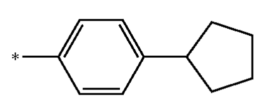
10-105
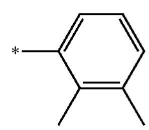
10-106
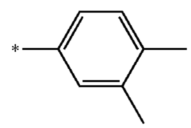
10-107
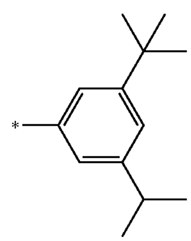
10-108
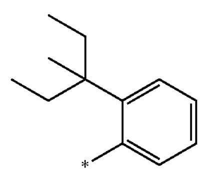
10-109
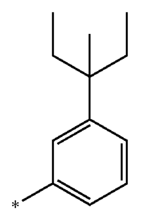

-continued
10-110
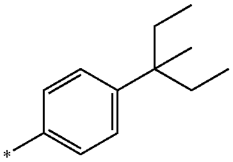
10-111
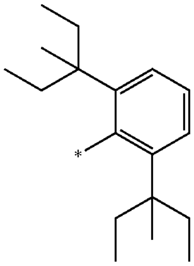
10-112
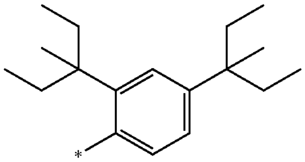
10-113
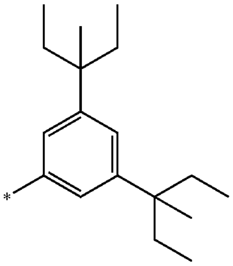
10-114
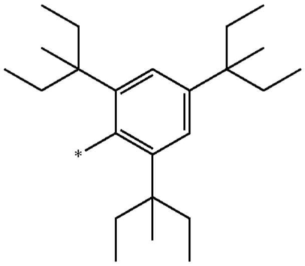
10-115
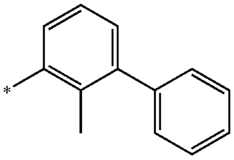
10-116
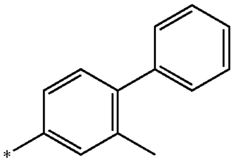
-continued
10-117
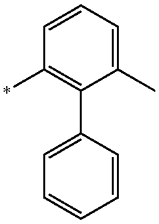
10-118
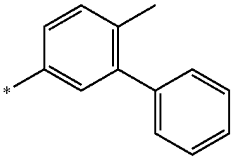
10-119
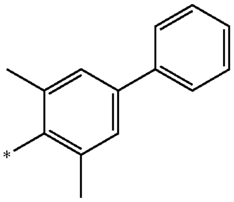
10-120
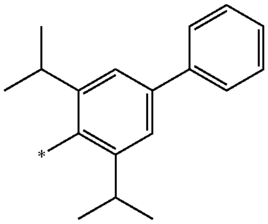
10-121
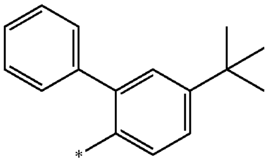
10-122
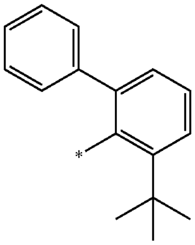
10-123
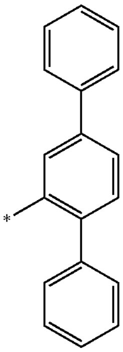

-continued
10-124
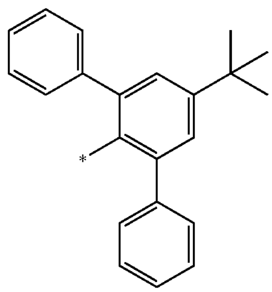
10-125
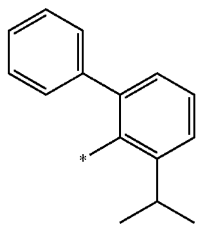
10-126
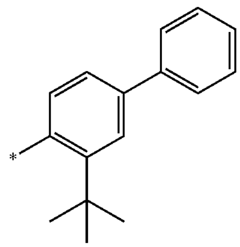
10-127
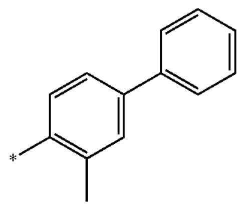
10-128
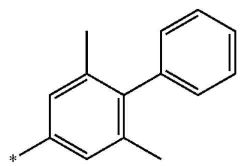
10-129
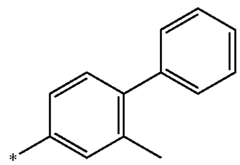
10-130
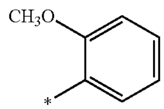
10-131
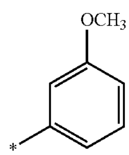
-continued
10-132
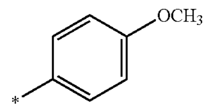
10-133
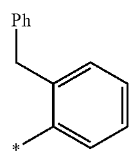
10-134
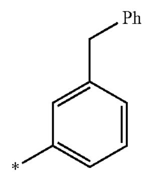
10-135
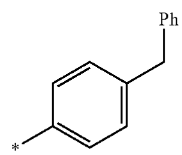
10-136
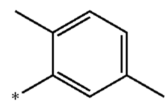
10-137
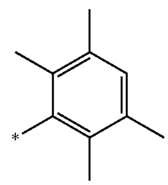
10-138
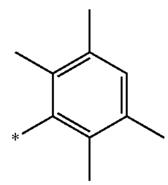
10-139
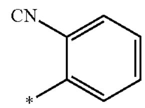
10-140
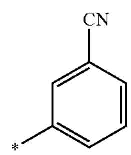
10-141
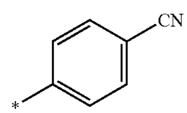

-continued
10-142
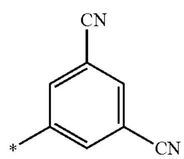
10-143
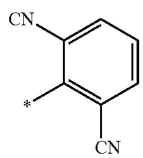
10-144
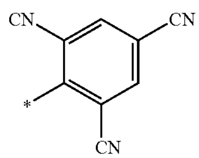
10-145
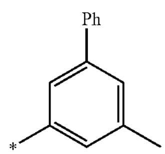
10-201
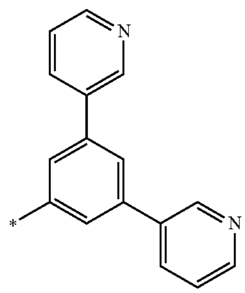
10-202
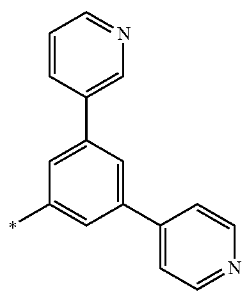
10-203
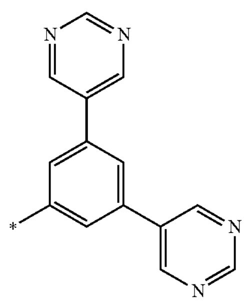
-continued
10-204
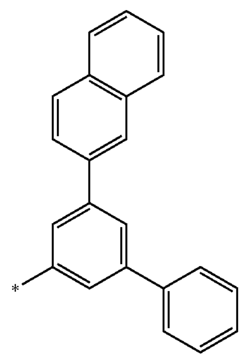
10-205
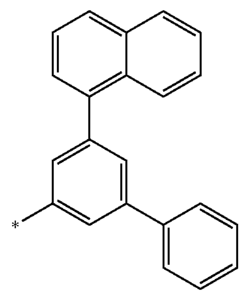
10-206
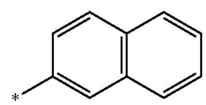
10-207
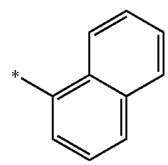
10-208
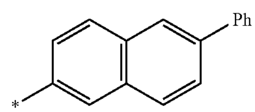
10-209
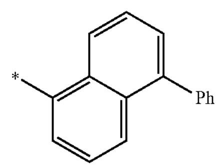
10-210
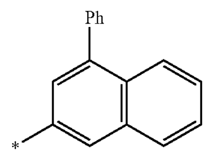
10-211
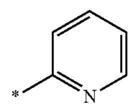

-continued
10-212
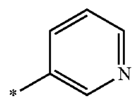
10-213
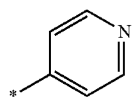
10-214
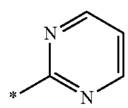
10-215
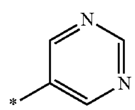
10-216
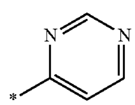
10-217
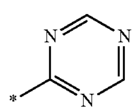
10-218
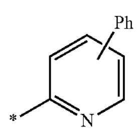
10-219
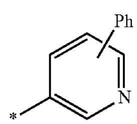
10-220
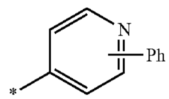
10-221
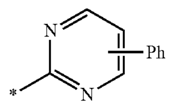
10-222
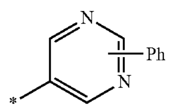
10-223
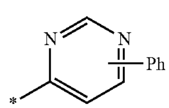
10-224
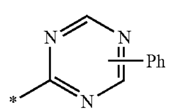
-continued
10-225
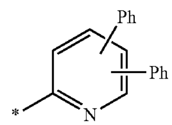
10-226
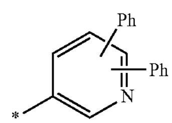
10-227
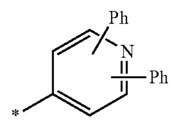
10-228
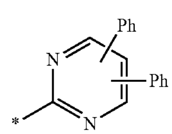
10-229
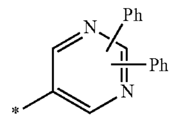
10-230
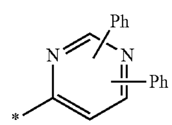
10-231
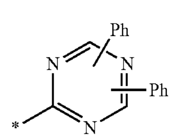
10-232
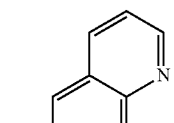
10-233
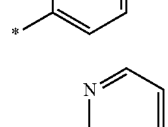
10-234
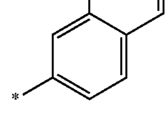
10-235
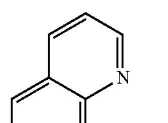
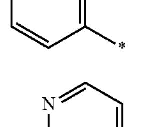
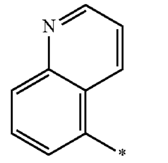

-continued
10-236
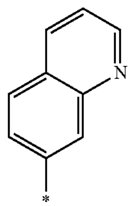
10-237
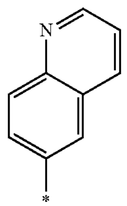
10-238
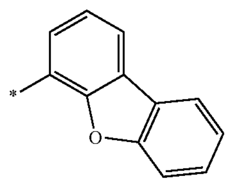
10-239
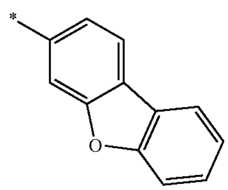
10-240
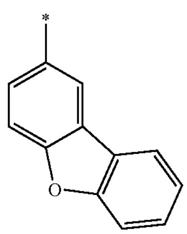
10-241
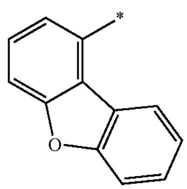
10-242
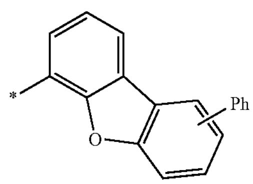
10-243
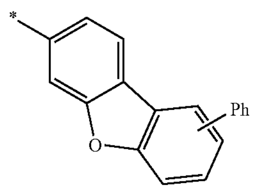
-continued
10-244
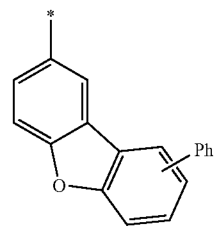
10-245
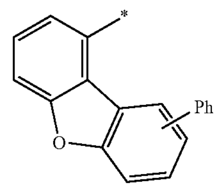
10-246
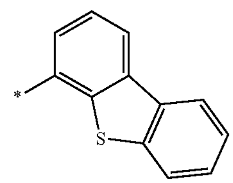
10-247
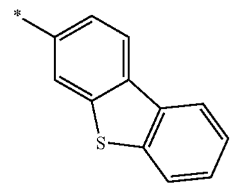
10-248
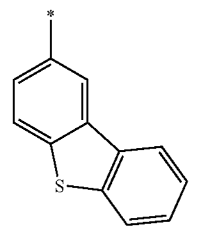
10-249
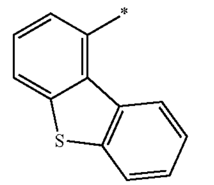
10-250
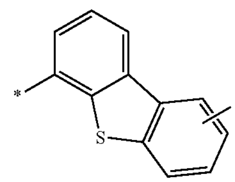
10-251
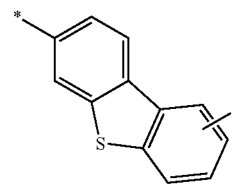

-continued
10-252
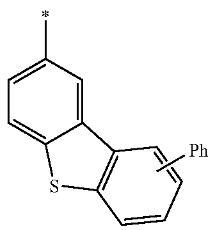
10-253
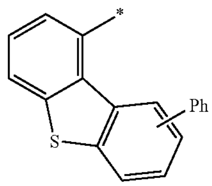
10-254
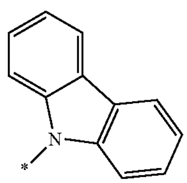
10-255
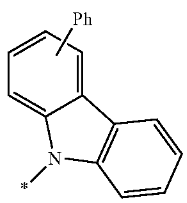
10-256
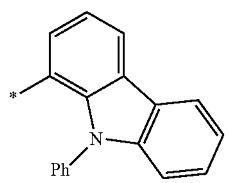
10-257
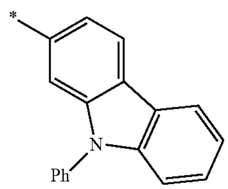
10-258
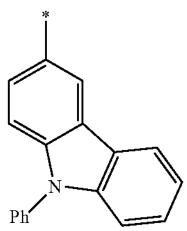
10-259
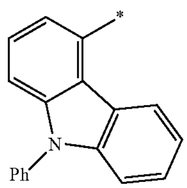
-continued
10-260
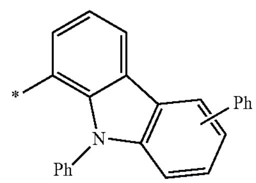
10-261
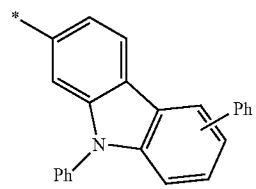
10-262
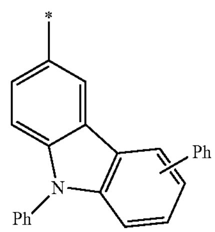
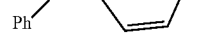
10-263
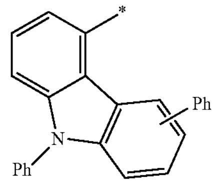
10-264
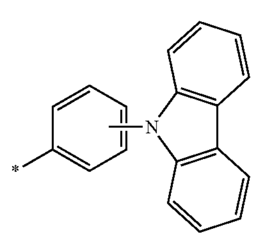
10-265
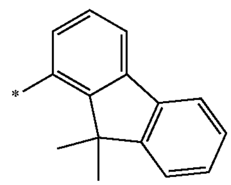
10-266
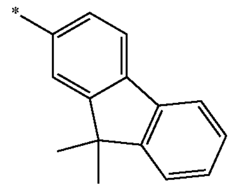

10-267
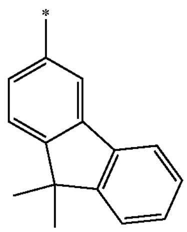
10-268
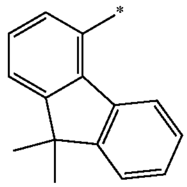
10-269
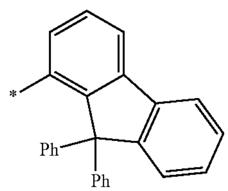
10-270
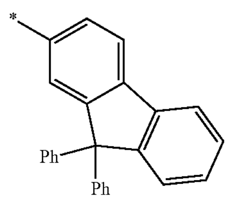
10-271
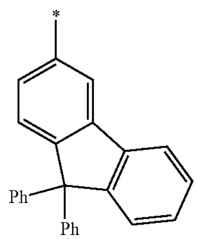
10-272
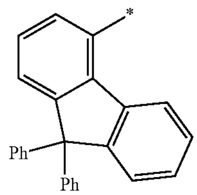
10-273
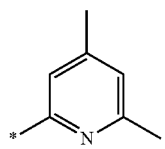
10-274
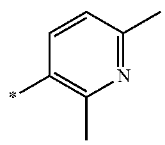
10-275
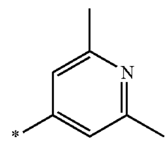
10-276
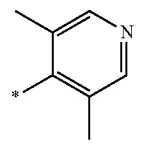
10-277
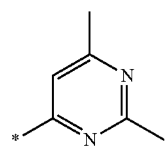
10-278
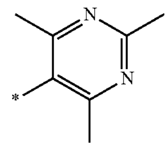
10-279
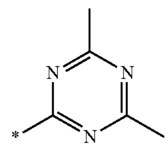
10-280
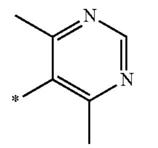
10-281
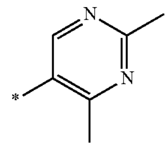
10-282
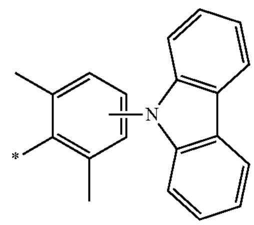
10-283
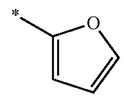
10-284
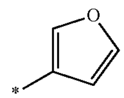
10-285
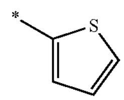

-continued
10-286
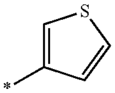
10-287
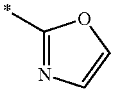
10-288
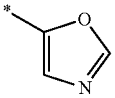
10-289
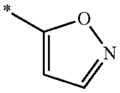
10-290
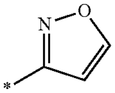
10-291
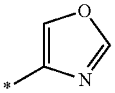
10-292
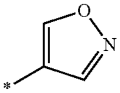
10-293
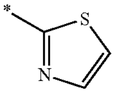
10-294
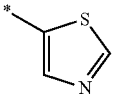
10-295
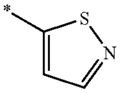
10-296
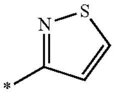
10-297
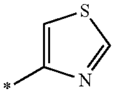
10-298
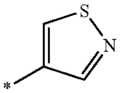
10-299
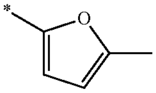
10-300
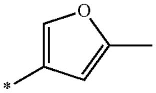
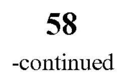
-continued
10-301
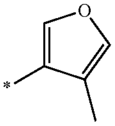
10-302
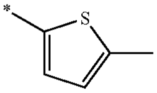
10-303
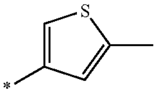
10-304
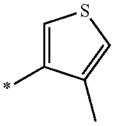
10-305
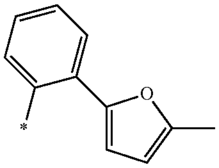
10-306
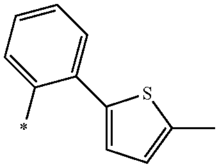
10-307
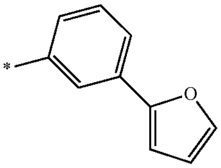
10-308
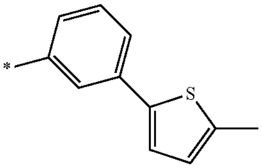
10-309
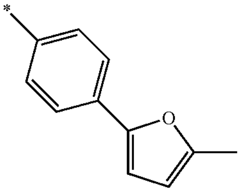
10-310
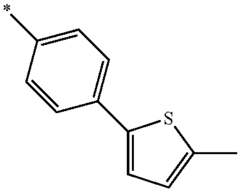

-continued
10-311
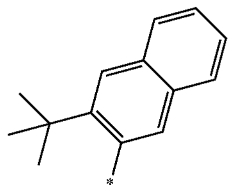
10-312
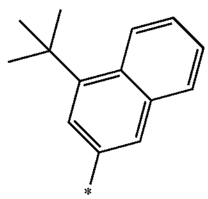
10-313
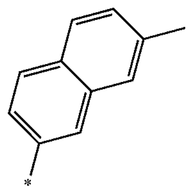
10-314
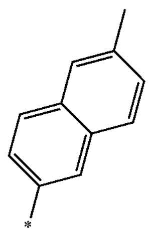
10-315
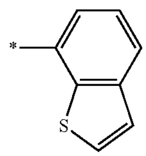
10-316
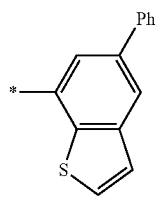
10-317
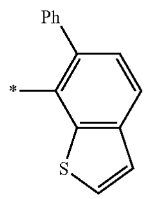
10-318
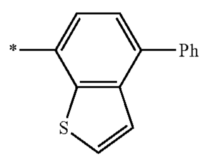
-continued
10-319
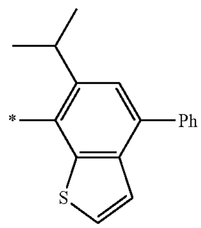
10-320
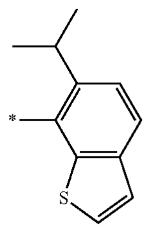
10-321
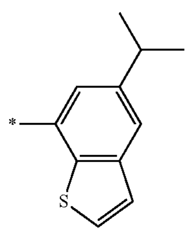
10-322
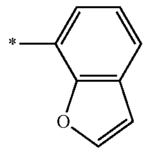
10-323
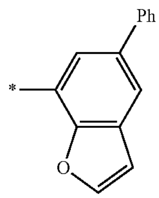
10-324
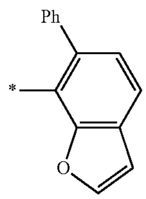
10-325
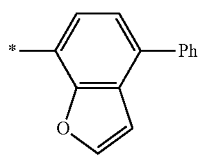

-continued
10-326
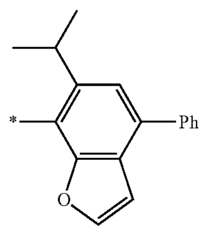
10-327
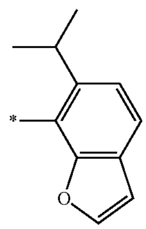
10-328
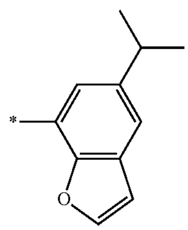
10-329
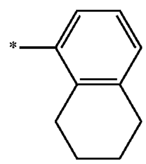
10-330
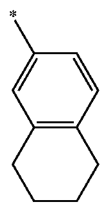
10-331
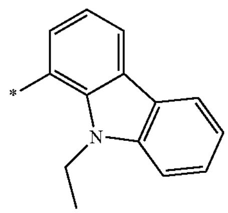
10-332
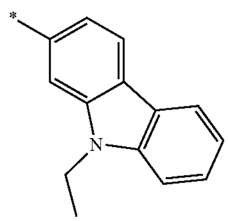
-continued
10-333
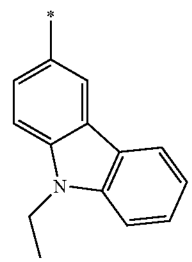
10-334
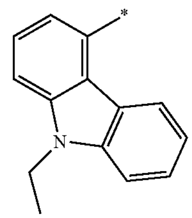
10-335
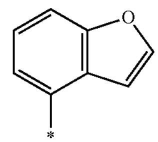
10-336
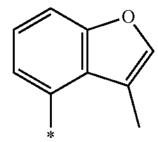
10-337
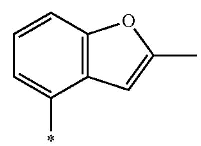
10-338
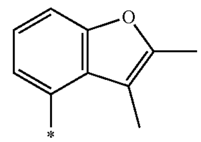
10-339
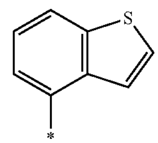
10-340
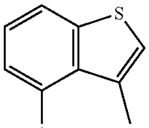
10-341
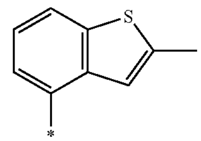

-continued 10-342

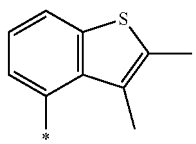

10-343

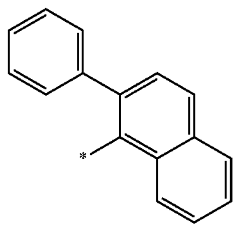

10-344

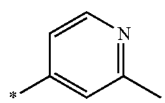

10-345

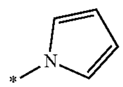

10-346

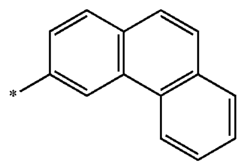

10-347

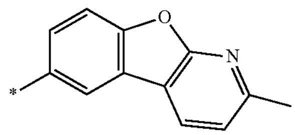

10-348

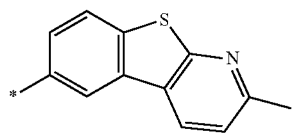

10-349

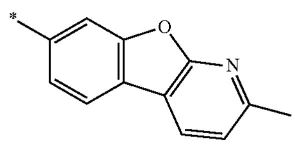

10-350

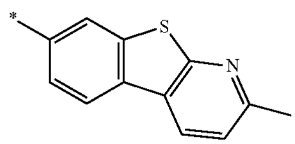

10-351

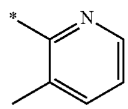

10-352

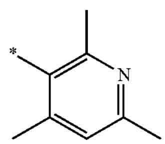

-continued 10-353

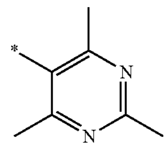

10-354

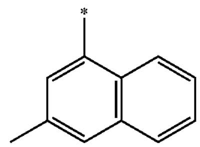

In Formulae 9-1 to 9-39, 9-201 to 9-230, 10-1 to 10-145, and 10-201 to 10-354, * indicates a binding site to an adjacent atom, "Ph" represents a phenyl group, "TMS" represents a trimethylsilyl group, "TMG" represents a trimethylgermyl group, and "OMe" represents a methoxy group.

The "group represented by one of Formulae 9-1 to 9-39 in which at least one hydrogen is substituted with deuterium" and the "group represented by one of Formulae 9-201 to 9-230 in which at least one hydrogen is substituted with deuterium" may each be, for example, a group represented by one of Formulae 9-501 to 9-514 and 9-601 to 9-637:

9-501

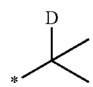

9-502

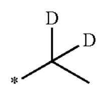

9-503

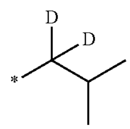

9-504

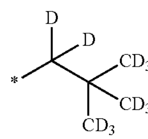

9-505

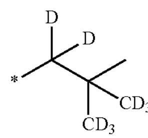

9-506

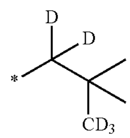

9-507

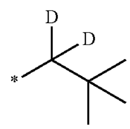

-continued
9-508
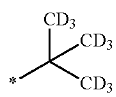
9-509
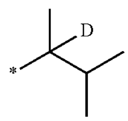
9-510
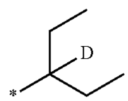
9-511
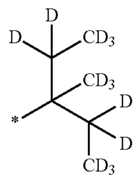
9-512
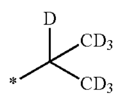
9-513
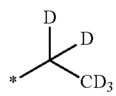
9-514
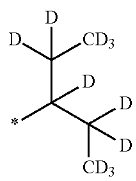
9-601
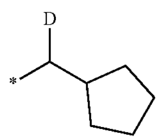
9-602
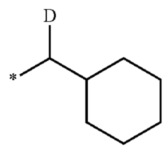
9-603
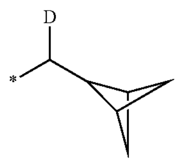
9-604
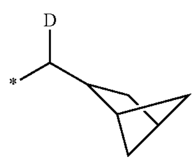
-continued
9-605
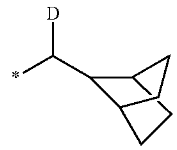
9-606
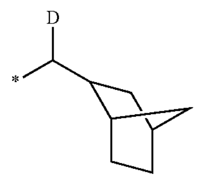
9-607
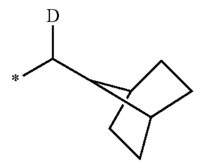
9-608
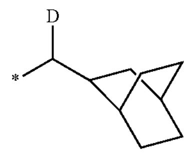
9-609
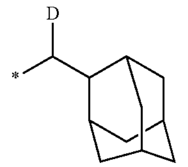
9-610
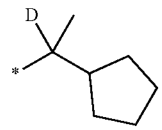
9-611
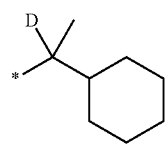
9-612
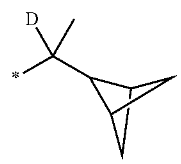
9-613
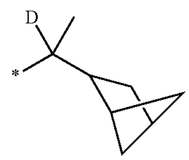
9-614
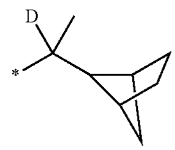

-continued
9-615
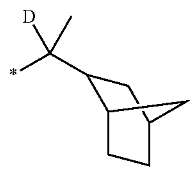
9-616
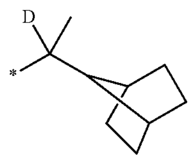
9-617
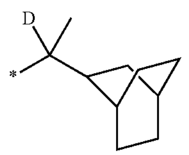
9-618
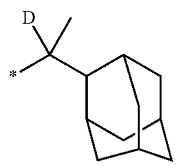
9-619
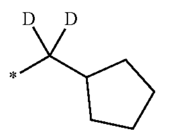
9-620
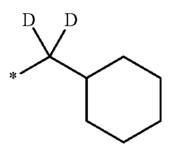
9-621
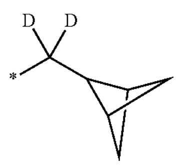
9-622
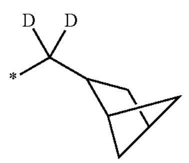
9-623
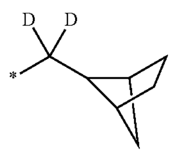
9-624
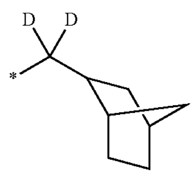
-continued
9-625
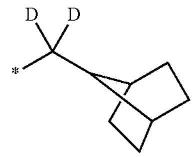
9-626
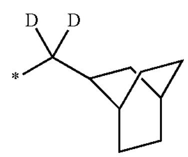
9-627
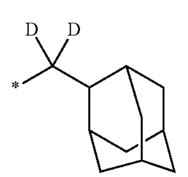
9-628
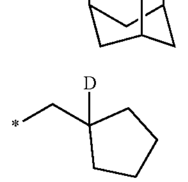
9-629
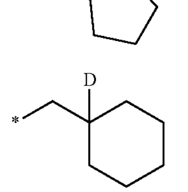
9-630
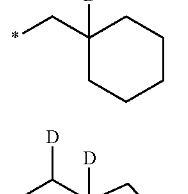
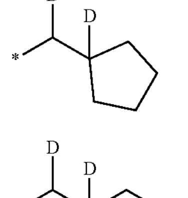
9-631
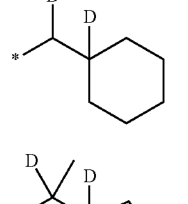
9-632
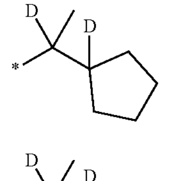
9-633
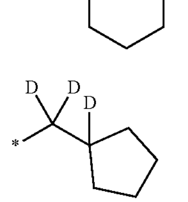
9-634
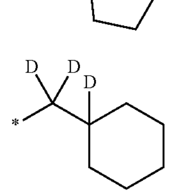
9-635
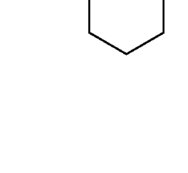

-continued 9-636

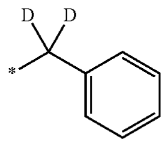

9-637

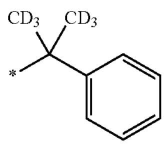

The "group represented by one of Formulae 9-1 to 9-39 in which at least one hydrogen is substituted with —F" and the "group represented by one of Formulae 9-201 to 9-230 in which at least one hydrogen is substituted with —F" may each be, for example, a group represented by one of Formulae 9-701 to 9-710:

9-701

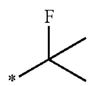

9-702

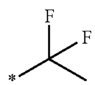

9-703

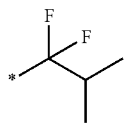

9-704

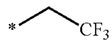

9-705

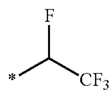

9-706

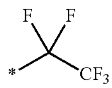

9-707

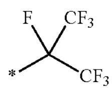

9-708

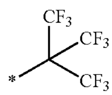

9-709

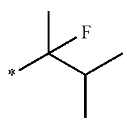

9-710

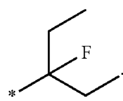

The "group represented by one of Formulae 10-1 to 10-145 in which at least one hydrogen is substituted with a deuterium" and the "group represented by one of Formulae 10-201 to 10-354 in which at least one hydrogen is substituted with deuterium" may each be, for example, a group represented by one of Formulae 10-501 to 10-553:

10-501

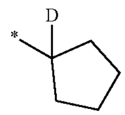

10-502

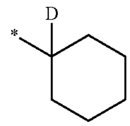

10-503

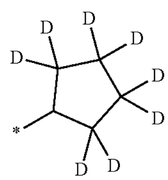

10-504

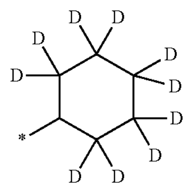

10-505

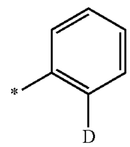

10-506

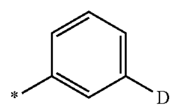

10-507

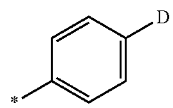

10-508

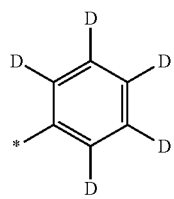

10-509

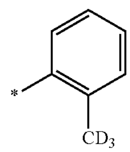

10-510

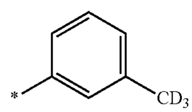

10-511
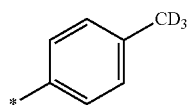
10-512
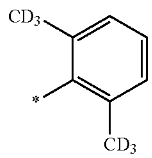
10-513
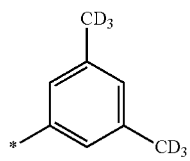
10-514
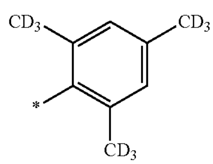
10-515
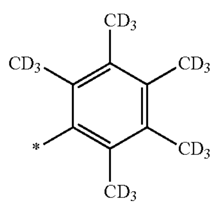
10-516
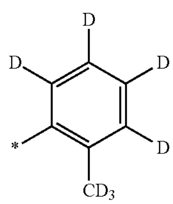
10-517
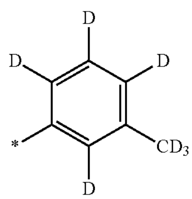
10-518
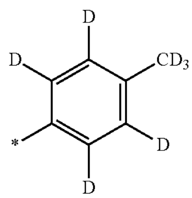
10-519
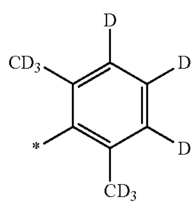
10-520
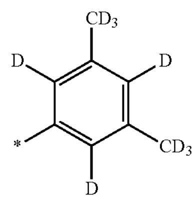
10-521
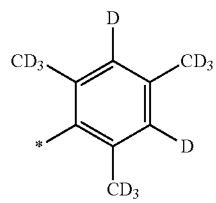
10-522
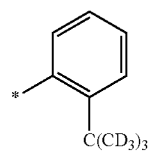
10-523
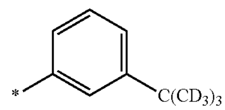
10-524
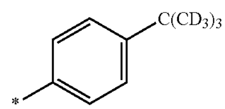
10-525
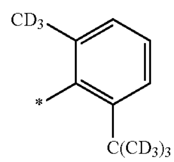
10-526
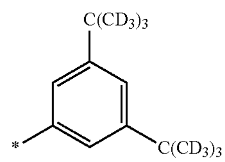
10-527
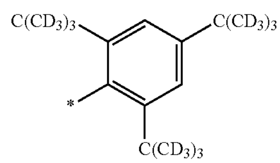
10-528
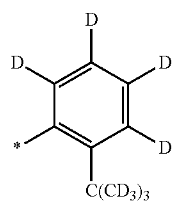

-continued
10-529
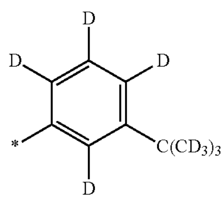
10-530
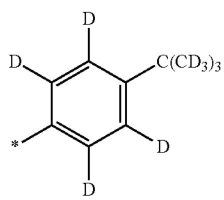
10-531
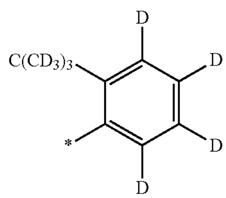
10-532
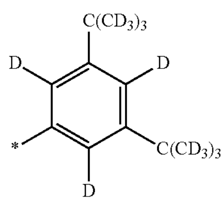
10-533
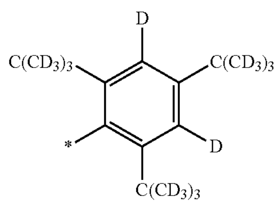
10-534
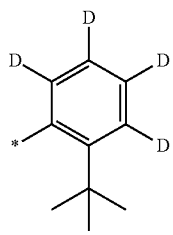
10-535
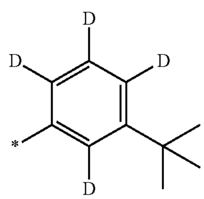
-continued
10-536
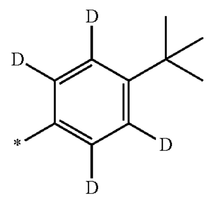
10-537
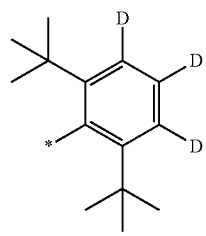
10-538
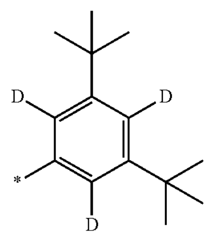
10-540
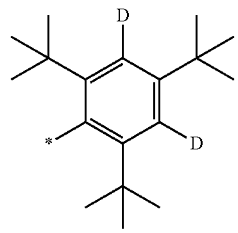
10-541
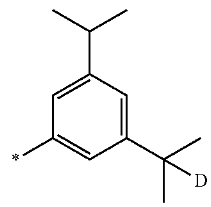
10-542
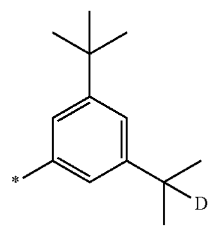
10-543
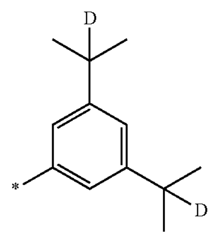

-continued
10-544
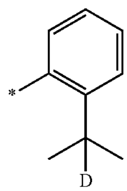
10-545
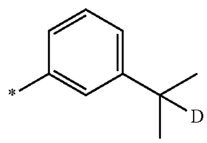
10-546
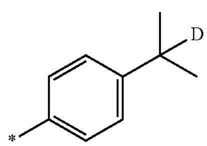
10-547
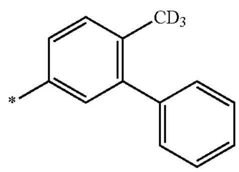
10-548
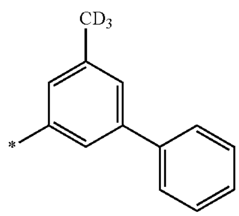
10-549
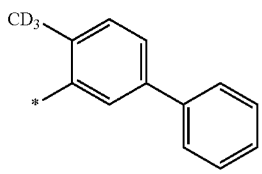
10-550
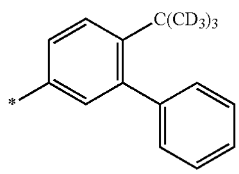
10-551
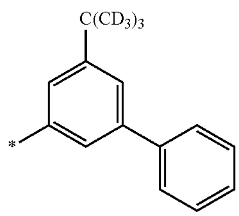
-continued
10-552
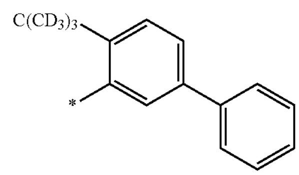
10-553
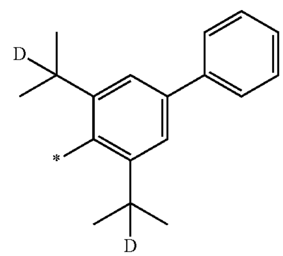
.
The “group represented by one of Formulae 10-1 to 10-145 in which at least one hydrogen is substituted with —F” and the “group represented by one of Formulae 10-201 to 10-354 in which at least one hydrogen is substituted with —F” may each be, for example, a group represented by one of Formulae 10-601 to 10-636:
10-601
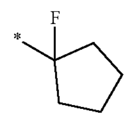
10-602
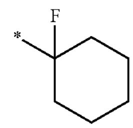
10-603
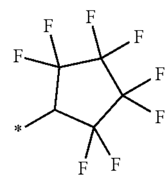
10-604
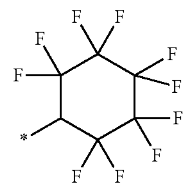
10-605
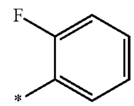
10-606
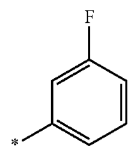

-continued
10-607
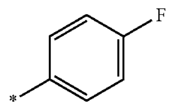
10-608
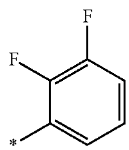
10-609
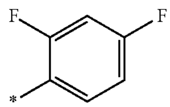
10-610
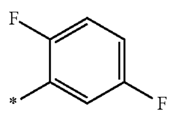
10-611
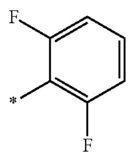
10-612
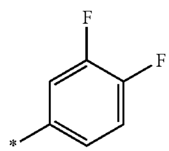
10-613
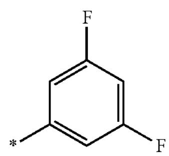
10-614
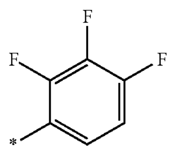
10-615
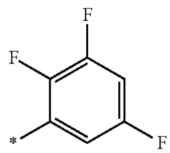
10-616
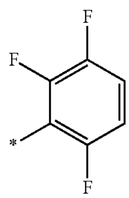
10-617
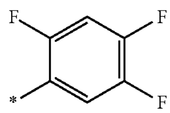
-continued
10-618
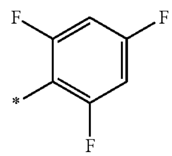
10-619
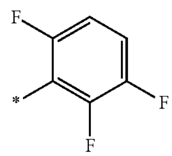
10-620
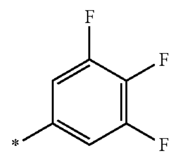
10-621
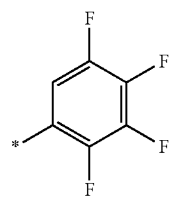
10-622
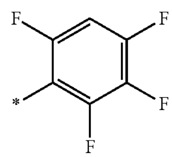
10-623
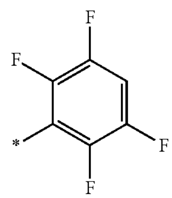
10-624
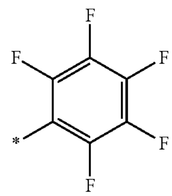
10-625
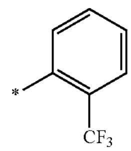
10-626
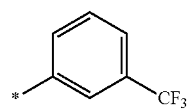

-continued 10-627

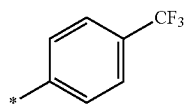

10-628

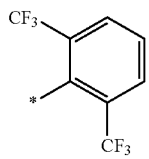

10-629

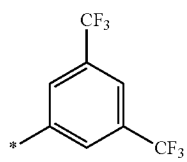

10-630

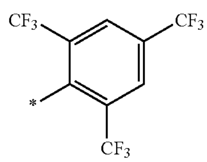

10-631

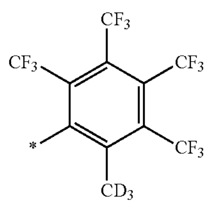

10-632

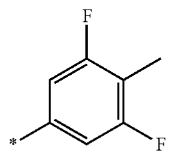

10-633

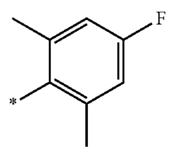

10-634

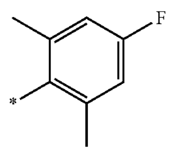

10-635

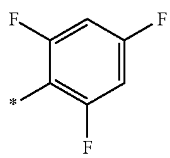

-continued 10-636

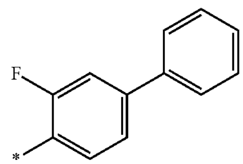

In Formulae 2A and 2B, i) at least two of a plurality of $R_1$(s) may optionally be bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, ii) at least two of a plurality of $R_2$(s) may optionally be bound to from a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iii) at least two of a plurality of $R_3$(s) may optionally be bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and iv) at least two of a plurality of $R_4$(s) may optionally be bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$. $R_{10a}$ may be understood by referring to the descriptions for $R_1$ provided herein.

and *' in Formulae 2A and 2B each indicate a binding site to M in Formula 1.

In an embodiment, in Formula 2A, a group represented by

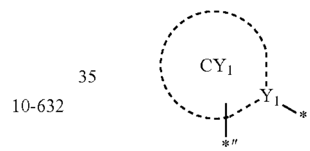

may be represented by one of Formulae CY1(1) to CY1(42):

CY1(1)

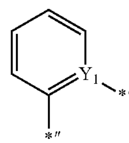

CY1(2)

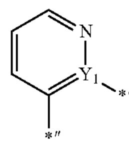

CY1(3)

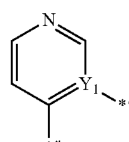

CY1(4)

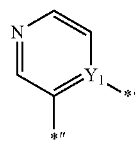

-continued
CY1(5)
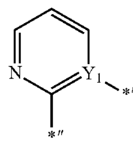
CY1(6)
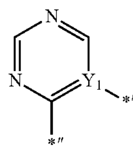
CY1(7)
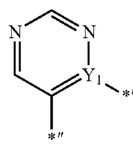
CY1(8)
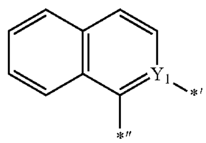
CY1(9)
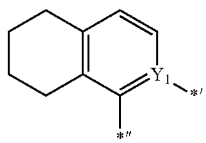
CY1(10)
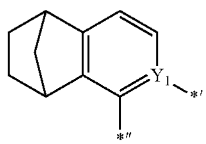
CY1(11)
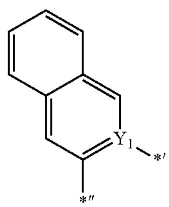
CY1(12)
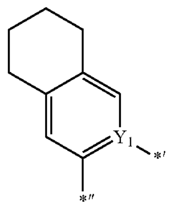
CY1(13)
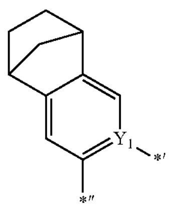
-continued
CY1(14)
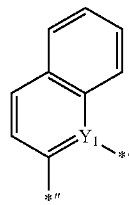
CY1(15)
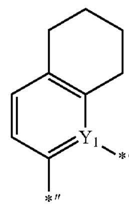
CY1(16)
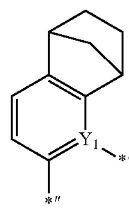
CY1(17)
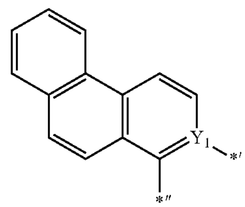
CY1(18)
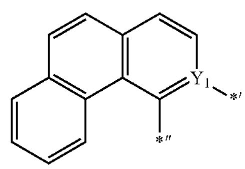
CY1(19)
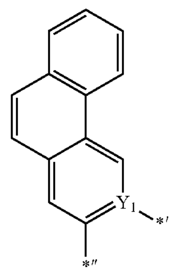
CY1(20)
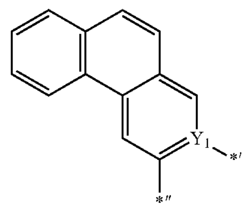

CY1(21)
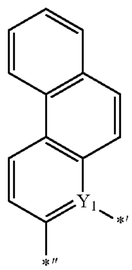
CY1(22)
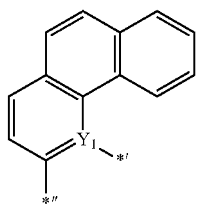
CY1(23)
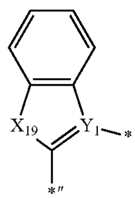
CY1(24)
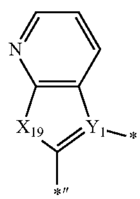
CY1(25)
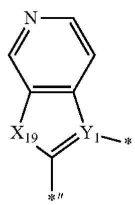
CY1(26)
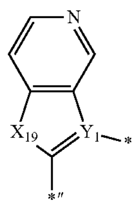
CY1(27)
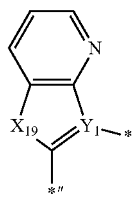
CY1(28)
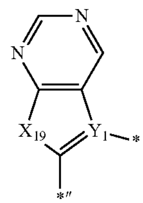
CY1(29)
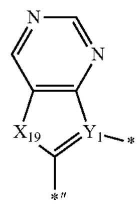
CY1(30)
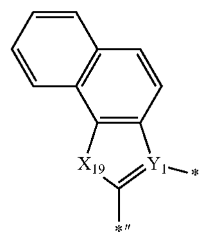
CY1(31)
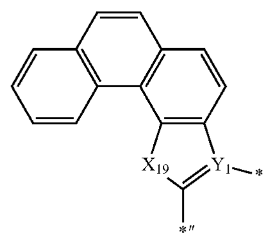
CY1(32)
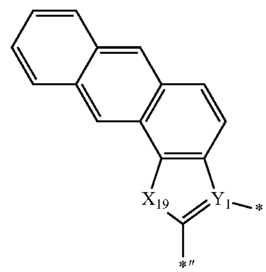
CY1(33)
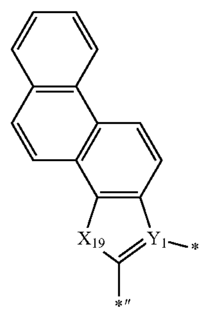

-continued

CY1(34)

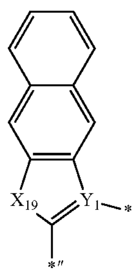

CY1(35)

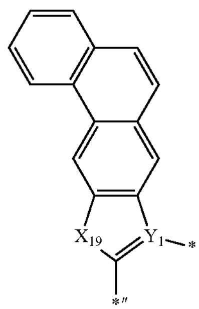

CY1(36)

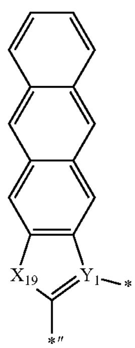

CY1(37)

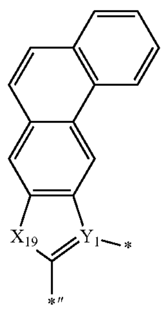

CY1(38)

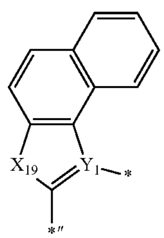

-continued

CY1(39)

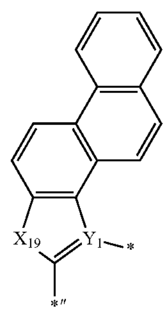

CY1(40)

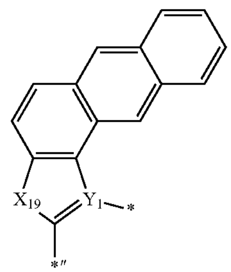

CY1(41)

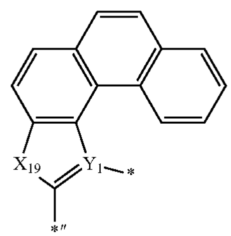

CY1(42)

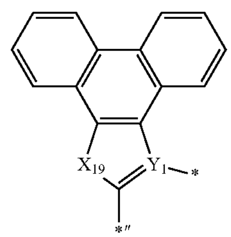

wherein, in Formulae CY1(1) to CY1(42), $X_{19}$ may be O, S, $N(R_{19a})$, $C(R_{19a})(R_{19b})$, or $Si(R_{19a})(R_{19b})$, and $R_{19a}$ and $R_{19b}$ may each be understood by referring to the description of $R_1$ provided herein, and

* indicates a binding site to M in Formula 1, and *" indicates a binding site to an adjacent carbon atom in Formula 2A.

For example, in Formula 2A, a group represented by

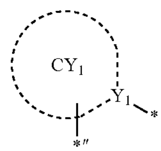

may be represented by one of Formulae CY1(1) to CY1(22).

In some embodiments, in Formula 2A, a group represented by

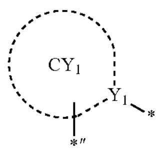
may be represented by one of Formulae CY1(23) to CY1 (42).
In one or more embodiments, in Formula 2A, a group represented by
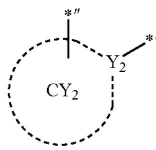
may be represented by one of Formulae CY2(1) to CY2(40):
CY2(1)
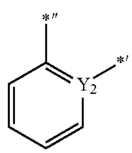
CY2(2)
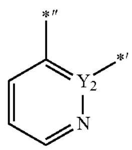
CY2(3)
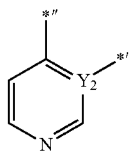
CY2(4)
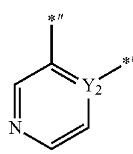
CY2(5)
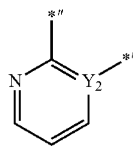
CY2(6)
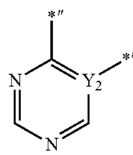
-continued
CY2(7)
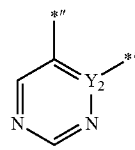
CY2(8)
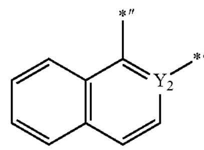
CY2(9)
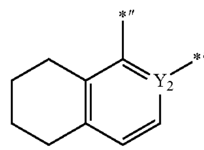
CY2(10)
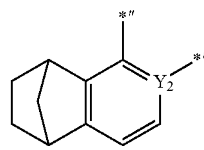
CY2(11)
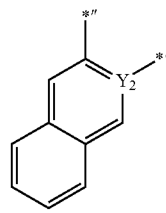
CY2(12)
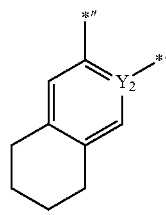
CY2(13)
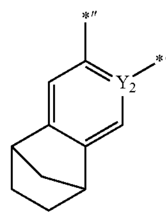
CY2(14)
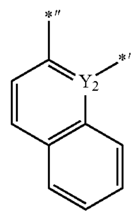

-continued
CY2(15)
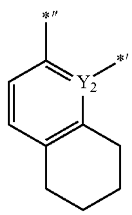
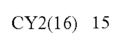
CY2(16)
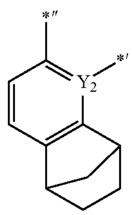
CY2(17)
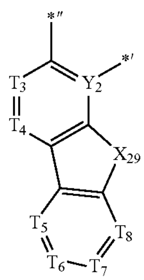
CY2(18)
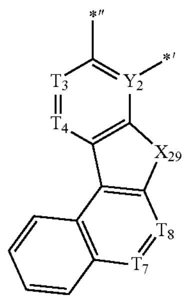
CY2(19)
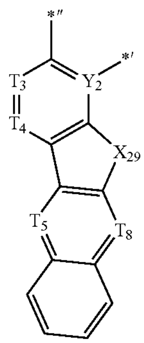
-continued
CY2(20)
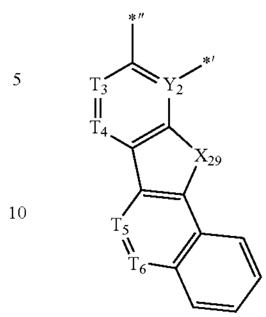
CY2(21)
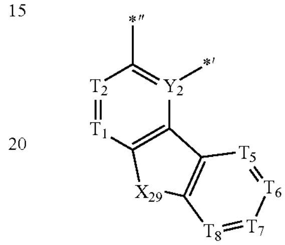
CY2(22)
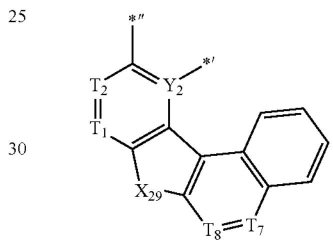
CY2(23)
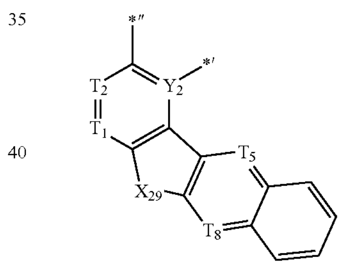
CY2(24)
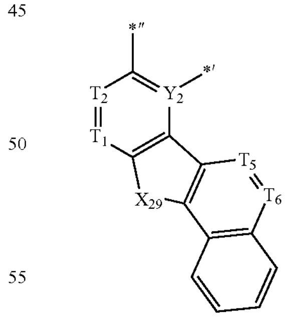
CY2(25)
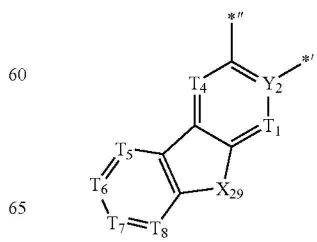

-continued
CY2(26)
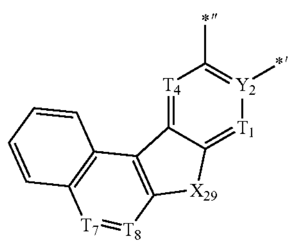
CY2(27)
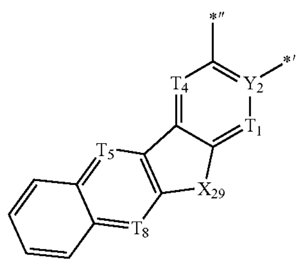
CY2(28)
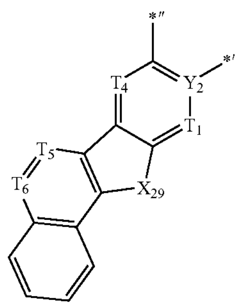
CY2(29)
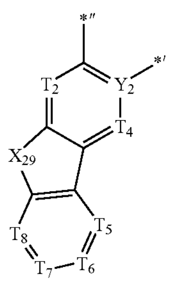
CY2(30)
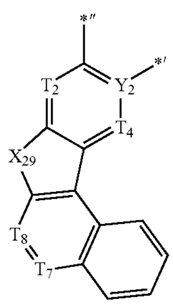
-continued
CY2(31)
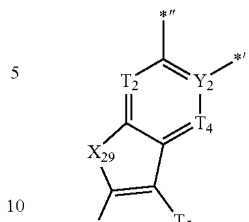
CY2(32)
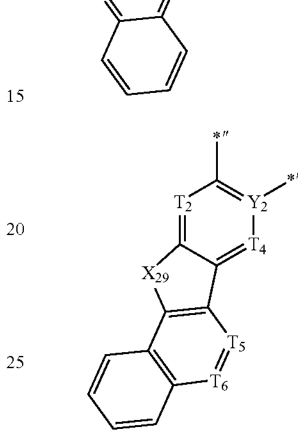
CY2(33)
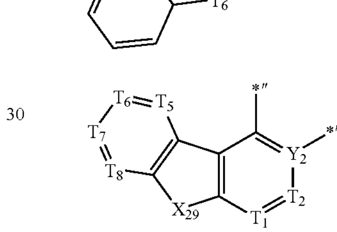
CY2(34)
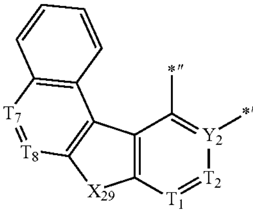
CY2(35)
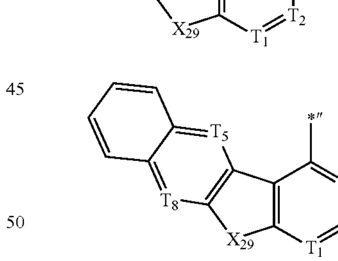
CY2(36)
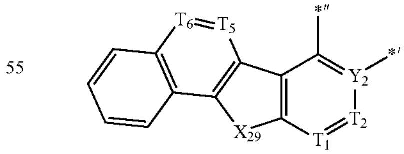
CY2(37)
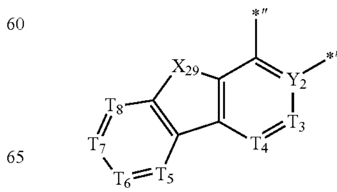

-continued

CY2(38)

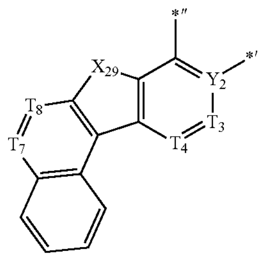

CY2(39)

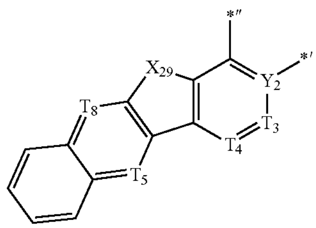

CY2(40)

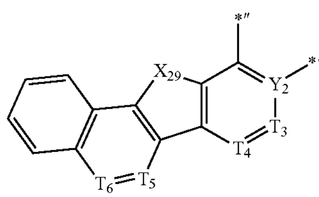

wherein, in Formulae CY2(1) to CY2(40), $T_1$ to $T_8$ may each be carbon or nitrogen, $X_{29}$ may be O, S, $N(R_{29a})$, $C(R_{29a})(R_{29b})$, or $Si(R_{29a})(R_{29b})$, and $R_{29a}$ and $R_{29b}$ may each be understood by referring to the description of $R_2$ provided herein, and

*' indicates a binding site to M in Formula 1, and *" indicates a binding site to ring $CY_1$ in Formula 2A.

For example, in Formulae CY2(17) to CY2(40), $T_1$ to $T_8$ may each be carbon.

In some embodiments, at least one of $T_3$ to $T_8$ in Formula CY2(17) may be nitrogen, at least one of $T_3$, $T_4$, $T_7$, and $T_8$ in Formula CY2(18) may be nitrogen, at least one of $T_3$, $T_4$, $T_5$, and $T_8$ in Formula CY2(19) may be nitrogen, at least one of $T_3$, $T_4$, $T_5$, and $T_6$ in Formula CY2(20) may be nitrogen, at least one of $T_1$, $T_2$, $T_5$, $T_6$, $T_7$ and $T_8$ in Formula CY2(21) may be nitrogen, at least one of $T_1$, $T_2$, $T_7$, and $T_8$ in Formula CY2(22) may be nitrogen, at least one of $T_1$, $T_2$, $T_5$, and $T_8$ in Formula CY2(23) may be nitrogen, at least one of $T_1$, $T_2$, $T_5$, and $T_6$ in Formula CY2(24) may be nitrogen, at least one of $T_1$, $T_4$, $T_5$, $T_6$, $T_7$ and $T_8$ in Formula CY2(25) may be nitrogen, at least one of $T_1$, $T_4$, $T_7$, and $T_8$ in Formula CY2(26) may be nitrogen, at least one of $T_1$, $T_4$, $T_5$, and $T_8$ in Formula CY2(27) may be nitrogen, at least one of $T_1$, $T_4$, $T_5$, and $T_6$ in Formula CY2(28) may be nitrogen, at least one of $T_2$, $T_4$, $T_5$, $T_6$, $T_7$ and $T_8$ in Formula CY2(29) may be nitrogen, at least one of $T_2$, $T_4$, $T_7$, and $T_8$ in Formula CY2(30) may be nitrogen, at least one of $T_2$, $T_4$, $T_5$, and $T_8$ in Formula CY2(31) may be nitrogen, at least one of $T_2$, $T_4$, $T_5$, and $T_6$ in Formula CY2(32) may be nitrogen, at least one of $T_1$, $T_2$, $T_5$, $T_6$, $T_7$ and $T_8$ in Formula CY2(33) may be nitrogen, at least one of $T_1$, $T_2$, $T_7$, and $T_8$ in Formula CY2(34) may be nitrogen, at least one of $T_1$, $T_2$, $T_5$, and $T_8$ in Formula CY2(35) may be nitrogen, at least one of $T_1$, $T_2$, $T_5$, and $T_6$ in Formula CY2(36) may be nitrogen, at least one of $T_3$ to $T_8$ in Formula CY2(37) may be nitrogen, at least one of $T_3$, $T_4$, $T_7$, and $T_8$ in Formula CY2(38) may be nitrogen, at least one of $T_3$, $T_4$, $T_8$, and $T_8$ in Formula CY2(39) may be nitrogen, or at least one of $T_3$ to $T_6$ in Formula CY2(40) may be nitrogen.

In some embodiments, in Formulae CY2(17) to CY2(40), $T_8$ may be N, and $T_1$ to $T_7$ may each be carbon.

In some embodiments, in Formula 2A, a group represented by

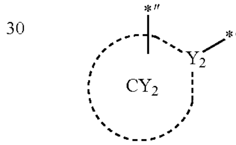

may be represented by one of Formulae CY2(17) to CY2 (40).

In one or more embodiments, in Formula 2B, a group represented by

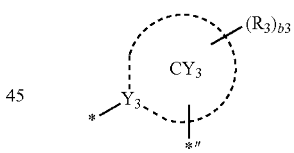

may be a group represented by Formula CY3(1):

CY3(1)

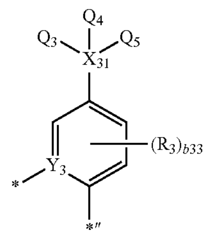

wherein, in Formula CY3(1), $X_{31}$ may be Si or Ge, $R_3$ and $Q_3$ to $Q_5$ may respectively be understood by referring to the descriptions of $R_3$ and $Q_3$ to $Q_5$ provided herein, b33 may each independently be an integer from 0 to 3, at least two of $R_3$(s) in the number of b33 may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$ (e.g., a cyclohexane group, a norbornane group, a benzene group, a pyridine group, a naphthalene group, a quinoline group, or an isoquinoline group, each unsubstituted or substituted with at least one $R_{10a}$),

* indicates a binding site to M in Formula 1, and

*" indicates a binding site to ring $CY_4$ in Formula 2B.

For example, in Formula CY3(1), at least one of $R_3$(s) in the number of b33 may include at least two carbon atoms.

In one or more embodiments, in Formula 2B, a group represented by

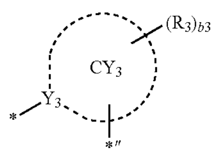

may be represented by one of Formulae CY3-1 to CY3-16:

CY3-1

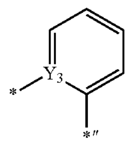

CY3-2

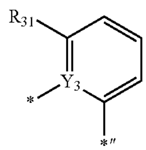

CY3-3

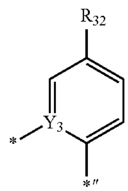

CY3-4

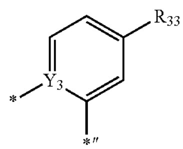

CY3-5

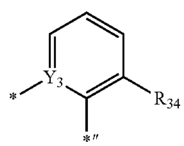

-continued

CY3-6

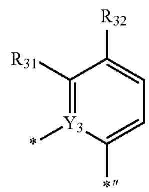

CY3-7

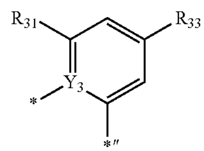

CY3-8

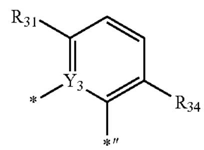

CY3-9

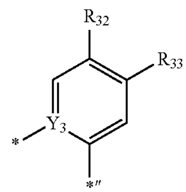

CY3-10

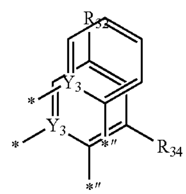

CY3-11

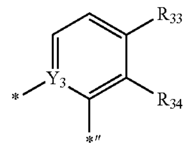

CY3-12

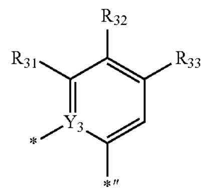

CY3-13

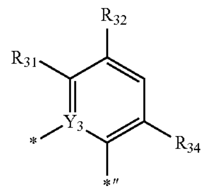

CY3-14

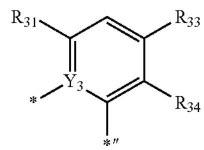

-continued

CY3-15

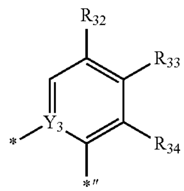

CY3-16

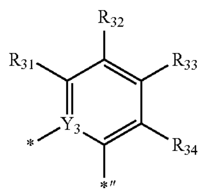

wherein, in Formulae CY3-1 to CY3-16, $R_{31}$ to $R_{34}$ may each be understood by referring to the description of $R_3$ provided herein, wherein $R_{31}$ to $R_{34}$ may each not be hydrogen,

* indicates a binding site to M in Formula 1, and

*" indicates a binding site to ring $CY_4$ in Formula 2B.

For example, in Formulae CY3-1 to CY3-16, $R_{32}$ may be a $C_1$-$C_{10}$ alkyl group substituted with at least one deuterium; —$Si(Q_3)(Q_4)(Q_5)$; or —$Ge(Q_3)(Q_4)(Q_5)$.

In some embodiments, in Formulae CY3-1 to CY3-16, $R_{33}$ may include at least two carbon atoms.

In some embodiments, in Formulae CY3-1 to CY3-16, $R_{33}$ and $R_{34}$ may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$ (e.g., a cyclohexane group, a norbornane group, a benzene group, a pyridine group, a naphthalene group, a quinoline group, or an isoquinoline group, each unsubstituted or substituted with at least one $R_{10a}$).

In some embodiments, in Formula 2B, a group represented by

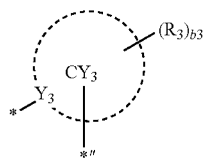

may be a group represented by Formula CY3-3, CY3-6, CY3-9, CY3-10, CY3-12, CY3-13, CY3-15, or CY3-16, and $R_{32}$ in Formulae CY3-3, CY3-6, CY3-9, CY3-10, CY3-12, CY3-13, CY3-15, and CY3-16 may be —$Si(Q_3)(Q_4)(Q_5)$ or —$Ge(Q_3)(Q_4)(Q_5)$.

In one or more embodiments, in Formula 2B, a group represented by

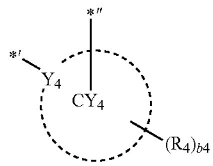

may be represented by one of Formulae CY4-1 to CY4-16:

CY4-1

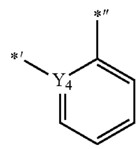

CY4-2

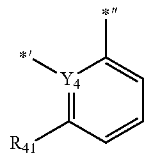

CY4-3

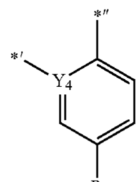

CY4-4

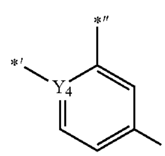

CY4-5

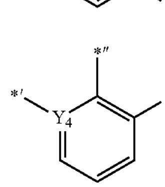

CY4-6

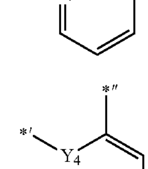

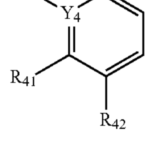

CY4-7

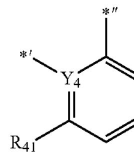

CY4-8

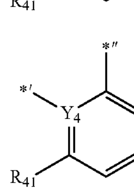

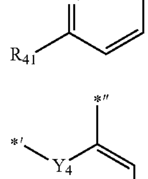

CY4-9

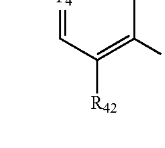

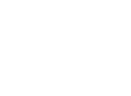

-continued

CY4-10

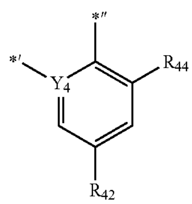

CY4-11

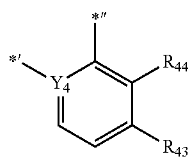

CY4-12

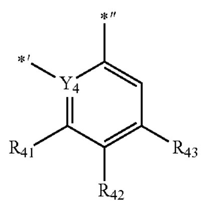

CY4-13

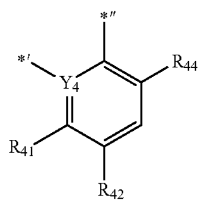

CY4-14

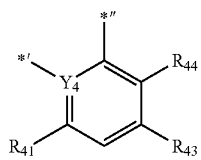

CY4-15

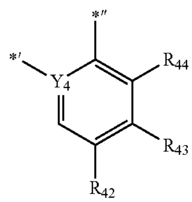

CY4-16

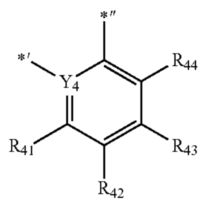

wherein, in Formulae CY4-1 to CY4-16, $R_{41}$ to $R_{44}$ may each be understood by referring to the description of $R_4$ provided herein, wherein $R_{41}$ to $R_{44}$ may each not be hydrogen, ' indicates a binding site to M in Formula 1, and " indicates a binding site to ring $CY_3$ in Formula 2B.

In an embodiment, the organometallic compound represented by Formula 1 may emit green light having a maximum emission wavelength in a range of about 500 nm to about 580 nm (in a photoluminescence (PL) spectrum).

In one or more embodiments, the organometallic compound represented by Formula 1 may satisfy Condition 1 or Condition 2:

Condition 1 wherein, in Formula 2A, a group represented by

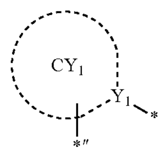

may be represented by one of Formulae CY1(1) to CY1(22), in Formula 2A, a group represented by

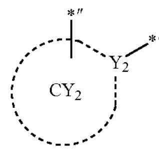

may be represented by one of Formulae CY2(17) to CY2 (40), in Formula 2B, a group represented by

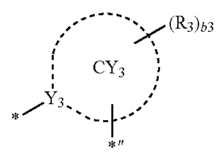

may be a group represented by Formula CY3(1) (for example, a group represented by Formula CY3-3, CY3-6, CY3-9, CY3-10, CY3-12, CY3-13, CY3-15, or CY3-16, wherein $R_{32}$ may be —$Si(Q_3)(Q_4)(Q_5)$ or —$Ge(Q_3)(Q_4)(Q_5)$), and in Formula 2B, a group represented by

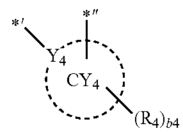

may be represented by one of Formulae CY4-1 to CY4-16, and

Condition 2 wherein, in Formula 2A, a group represented by

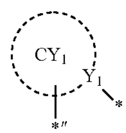

may be represented by one of Formulae CY1(23) to CY1 (42), in Formula 2A, a group represented by

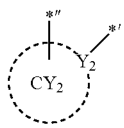

may be represented by one of Formulae CY2(17) to CY2 (40), in Formula 2B, a group represented by

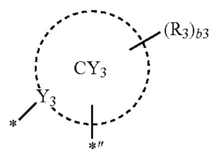

may be represented by Formula CY3(1) (for example, a group represented by Formula CY3-3, CY3-6, CY3-9, CY3-10, CY3-12, CY3-13, CY3-15, or CY3-16, wherein $R_{32}$ may be —$Si(Q_3)(Q_4)(Q_5)$ or —$Ge(Q_3)(Q_4)(Q_5)$), and in Formula 2B, a group represented by

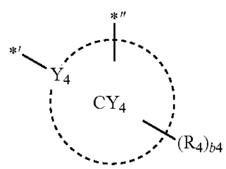

may be represented by one of Formulae CY4-1 to CY4-16.

Description for Formulae 5 and 7

Formula 5

Formula 7

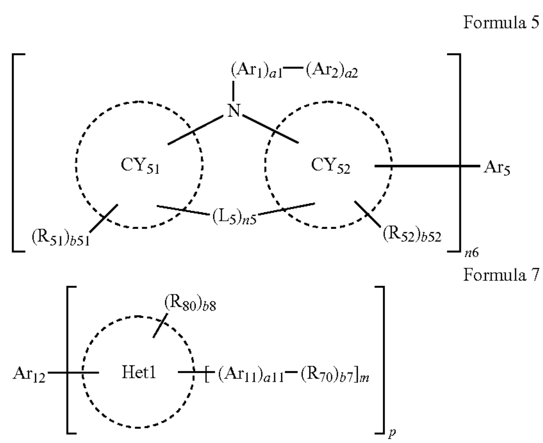

In Formulae 5 and 7, $Ar_1$, $Ar_2$, and $Ar_{11}$ may each independently be a $C_5$-$C_{60}$ carbocyclic group unsubstituted or substituted with at least one $R_{50}$ or a $C_1$-$C_{60}$ heterocyclic group unsubstituted or substituted with at least one $R_{50}$.

In Formulae 5 and 7, $Ar_5$ and $Ar_{12}$ may each independently be a single bond, a $C_5$-$C_{60}$ carbocyclic group unsubstituted or substituted with at least one $R_{50a}$, or a $C_1$-$C_{60}$ heterocyclic group unsubstituted or substituted with at least one $R_{50a}$, or $Ar_5$ and $Ar_{12}$ may not be present.

In Formula 5, n6 may be 1, 2, or 3, and when n6 is 1, $Ar_5$ may not be present.

In Formula 7, p may be 1, 2, or 3, and when p is 1, $Ar_{12}$ may not be present.

In Formula 5, a1 and a2 may each independently be an integer from 0 to 5, and the sum of a1 and a2 may be 1 or greater.

In Formula 5, ring $CY_{51}$, and ring $CY_{52}$ may each independently be a $C_5$-$C_{60}$ carbocyclic group or a $C_1$-$C_{60}$ heterocyclic group, and ring $CY_{51}$ and ring $CY_{52}$ may optionally be bound to each other via a $C_5$-$C_{60}$ carbocyclic group unsubstituted or substituted with at least one $R_{50b}$ or a $C_1$-$C_{60}$ heterocyclic group unsubstituted or substituted with at least one $R_{50b}$.

In Formula 5, $L_5$ may be a single bond, O, S, $N(R_{50c})$, $C(R_{50c})(R_{50d})$, or $Si(R_{50c})(R_{50d})$, n5 may be 0 or 1, and when n5 is 0, $L_5$ may not be present, In Formula 7, Het1 may be a π electron-depleted nitrogen-containing $C_1$-$C_{60}$ cyclic group.

In Formula 7, a11 and m may each independently be an integer from 1 to 10.

The term "π electron-depleted nitrogen-containing $C_1$-$C_{60}$ cyclic group" used herein refers to a cyclic group having 1 to 60 carbon atoms including at least one *—N=*' as a ring-forming moiety, and may be, for example, a) a first ring, b) a condensed ring in which at least two first rings are condensed with each other, or c) a condensed ring in which at least one first ring is condensed with at least one second ring. The first ring and the second ring may respectively be understood by referring to the descriptions of the first ring and the second ring provided herein.

The π electron-depleted nitrogen-containing $C_1$-$C_{60}$ cyclic group may be, for example, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a benzonaphthofuran group, a benzonapthothiophene group, an (indolo)phenanthrene group, a (benzofurano)phenanthrene group, a (benzothieno)phenanthrene group, or a pyridopyrazine group.

The term "π electron-rich $C_3$-$C_{60}$ cyclic group" used herein refers to a cyclic group having 3 to 60 carbon atoms not including *—N=*' as a ring-forming moiety, and may be, for example, a) a second ring or b) a condensed cyclic group in which at least two second rings are condensed with each other. The second ring may be understood by referring to the description of the second ring provided herein.

The π electron-rich $C_3$-$C_{60}$ cyclic group may be, for example, a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, dihydroacridine group, a pyrrolophenanthrene group, a furanophenanthrene group, or a thienophenanthrene group.

In some embodiments, $Ar_1$, $Ar_2$, and $Ar_{11}$ in Formulae 5 and 7 may each independently be a group derived from i) a first ring unsubstituted or substituted with at least one $R_{50}$, ii) a second ring unsubstituted or substituted with at least one $R_{50}$, iii) a condensed ring in which at least two first rings unsubstituted or substituted with at least one $R_{50}$ are condensed, iv) a condensed ring in which at least two second rings unsubstituted or substituted with at least one $R_{50}$ are condensed, or v) a condensed ring in which at least one first ring and at least one second ring, each unsubstituted or substituted with at least one $R_{50}$, are condensed, $Ar_5$ and $Ar_{12}$ in Formulae 5 and 7 may each independently be a single bond, or a group derived from i) a first ring unsubstituted or substituted with at least one $R_{50a}$, ii) a second ring unsubstituted or substituted with at least one $R_{50a}$, iii) a condensed ring in which at least two first rings unsubstituted or substituted with at least one $R_{50a}$ are condensed, iv) a condensed ring in which at least two second rings unsubstituted or substituted with at least one $R_{50a}$ are condensed, or v) a condensed ring in which at least one first ring and at least one second ring, each unsubstituted or substituted with at least one $R_{50a}$, are condensed, or $Ar_5$ and $Ar_{12}$ may not be present, ring $CY_{51}$ and ring $CY_{52}$ in Formula 5 may each independently be i) a first ring, ii) a second ring, iii) a condensed ring in which at least two first rings are condensed, iv) a condensed ring in which at least two second rings are condensed, or v) a condensed ring in which at least one first ring and at least one second ring are condensed, Het1 in Formula 7 may be i) a first ring, ii) a condensed ring in which at least two first rings are condensed, or iii) a condensed ring in which at least one first ring and at least one second ring are condensed, the first ring may be an imidazole group, a pyrazole group, a thiazole group, an isothiazole group, an oxazole group, an isoxazole group, a pyridine group, a pyrazine group, a pyridazine group, a pyrimidine group, a triazole group, a tetrazole group, an oxadiazole group, a triazine group, or a thiadiazole group, and the second ring may be a benzene group, a cyclopentadiene group, a pyrrole group, a furan group, a thiophene group, or a silole group.

In one or more embodiments, in Formulae 5 and 7, $Ar_1$, $Ar_2$, and $Ar_{11}$ may each independently be a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a benzonaphthofuran group, a benzonapthothiophene group, an (indolo)phenanthrene group, a (benzofurano)phenanthrene group, or a (benzothieno)phenanthrene group.

In one or more embodiments, in Formulae 5 and 7, $Ar_5$ and $Ar_{12}$ may each independently be a single bond, or a benzene group, a naphthalene group, or a carbazole group, each unsubstituted or substituted with at least one $R_{50a}$, or $Ar_5$ and $Ar_{12}$ may not be present.

In one or more embodiments, in Formula 5, ring $CY_{51}$ and ring $CY_{52}$ may each independently be a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a pyrrolophenanthrene group, a furanophenanthrene group, or a thienophenanthrene group.

In one or more embodiments, Het1 in Formula 7 may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, or a pyridopyrazine group.

In one or more embodiments, in Formulae 5 and 7, $Ar_1$, $Ar_2$, and $Ar_{11}$ may each independently be a π electron-rich $C_3$-$C_{60}$ cyclic group unsubstituted or substituted with at least one $R_{50}$.

In one or more embodiments, in Formulae 5 and 7, $Ar_5$ and $Ar_{12}$ may each independently be a single bond or a π electron-rich $C_3$-$C_{60}$ cyclic group unsubstituted or substituted with at least one $R_{50a}$, or $Ar_5$ and $Ar_{12}$ may not be present.

In one or more embodiments, in Formula 5, ring $CY_{51}$ and ring $CY_{52}$ may each independently be a π electron-rich $C_3$-$C_{60}$ cyclic group.

In one or more embodiments, in Formulae 5 and 7, n and p may each independently be 1 or 2.

In one or more embodiments, in Formula 5, n6 may be 1, and at least one of ring $CY_{51}$ and $CY_{52}$ may not be a benzene group.

In some embodiments, in Formula 5, when n6 is 1, at least one of ring $CY_{51}$ and ring $CY_{52}$ may be a) a condensed ring in which at least two first rings are condensed, b) a condensed ring in which at least two second rings are condensed, or c) a condensed ring in which at least one first ring and at least one second ring are condensed. The first ring and the second ring may respectively be understood by referring to the descriptions of the first ring and the second ring provided herein.

In one or more embodiments, the compound represented by Formula 5 may include a compound represented by Formula 5(1):

Formula 5(1)

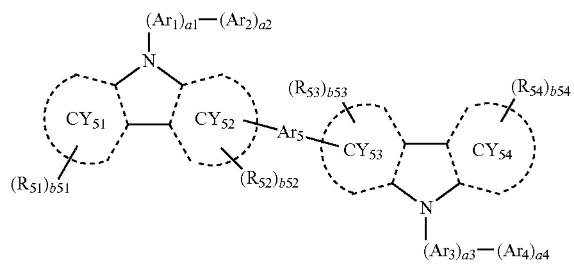

wherein, in Formula 5(1), $Ar_5$ may be a single bond, a $C_5$-$C_{60}$ carbocyclic group unsubstituted or substituted with at least one $R_{50a}$, or a $C_1$-$C_{60}$ heterocyclic group unsubstituted or substituted with at least one $R_{50a}$, $Ar_1$, $Ar_2$, $Ar_5$, a1, a2, ring $CY_{51}$, ring $CY_{52}$, $R_{51}$, $R_{52}$, b51, and b52 may respectively be understood by referring to the descriptions of $Ar_1$, $Ar_2$, $Ar_5$, a1, a2, ring $CY_{51}$, ring $CY_{52}$, $R_{51}$, $R_{52}$, b51, and b52 provided herein, $Ar_3$ and $Ar_4$ may each independently be a $C_5$-$C_{60}$ carbocyclic group unsubstituted or substituted with at least one $R_{50}$ or a $C_1$-$C_{60}$ heterocyclic group unsubstituted or substituted with at least one $R_{50}$, and a3, a4, ring $CY_{53}$, ring $CY_{54}$, $R_{53}$, $R_{54}$, b53, and b54 may respectively be understood by referring to the descriptions of a1, a2, ring $CY_{51}$, ring $CY_{52}$, $R_{51}$, $R_{52}$, b51, and b52 provided herein.

For example, in Formula 5(1), $Ar_5$ may be a single bond.

In one or more embodiments, the compound represented by Formula 7 may include a compound represented by Formula 7(1):

Formula 7(1)

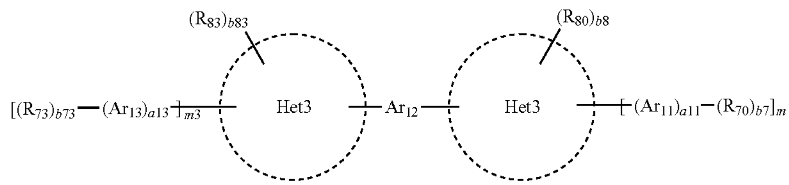

wherein, in Formula 7(1), $Ar_{12}$ may be a single bond, a $C_5$-$C_{60}$ carbocyclic group unsubstituted or substituted with at least one $R_{50a}$, or a $C_1$-$C_{60}$ heterocyclic group unsubstituted or substituted with at least one $R_{50a}$, Het1, $Ar_{11}$, $R_{70}$, $R_{80}$, a11, b7, b8, and m may respectively be understood by referring to the descriptions of Het1, $Ar_{11}$, $R_{70}$, $R_{80}$, a11, b7, b8, and m provided herein, and Het3, $Ar_{13}$, $R_{73}$, $R_{83}$, a13, b73, b83, and m3 may respectively be understood by referring to the descriptions of Het1, $Ar_{11}$, $R_{70}$, $R_{80}$, a11, b7, b8, and m provided herein.

In one or more embodiments, the first electron-transporting compound and the second electron-transporting compound may each include a carbazole group, and the number of carbazole group(s) in the first electron-transporting compound may be greater than the number of carbazole group(s) in the second electron-transporting compound.

In one or more embodiments, the number of carbazole group(s) in the first electron-transporting compound may be 2 or greater.

In one or more embodiments, the number of carbazole group(s) in the second electron-transporting compound may be 0 or 1.

In one or more embodiments, the first electron-transporting compound may be a compound represented by Formula 7S, and the second electron-transporting compound may be a compound represented by Formula 7F:

7S

7F

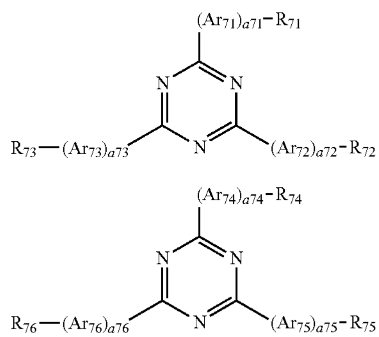

wherein, in Formulae 7S and 7F, $Ar_{71}$ to $Ar_{76}$ may each be understood by referring to the description of $Ar_{11}$ in Formula 7, a71 to a76 may each be understood by referring to the description of a11 in Formula 7, and $R_{71}$ to $R_{76}$ may each be understood by referring to the description of $R_{70}$ in Formula 7.

In an embodiment, in Formulae 7S and 7F, $Ar_{71}$ to $Ar_{76}$ may each independently be a benzene group or a carbazole group, each unsubstituted or substituted with deuterium, a $C_1$-$C_{20}$ alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl)biphenyl group, or any combination thereof.

In one or more embodiments, in Formulae 7S and 7F, a71 to a76 may each independently be 1, 2, or 3.

In one or more embodiments, in Formulae 7S and 7F, $R_{71}$ to $R_{76}$ may each independently be hydrogen, deuterium, a $C_1$-$C_{20}$ alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl)biphenyl group, a carbazolyl group, a deuterated carbazolyl group, a ($C_1$-$C_{20}$ alkyl)carbazolyl group, a di($C_1$-$C_{20}$ alkyl)carbazolyl group, or a (phenyl)carbazolyl group.

In one or more embodiments, the number of carbazole group(s) in the compound represented by Formula 7S may be 2 or greater.

In one or more embodiments, the number of carbazole group(s) in the compound represented by Formula 7F may be 0 or 1.

In one or more embodiments, in Formula 7S, $Ar_{73}$ may be a benzene group unsubstituted or substituted with deuterium, a $C_1$-$C_{20}$ alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl)biphenyl group, or any combination thereof, and $R_{73}$ may be hydrogen, deuterium, a $C_1$-$C_{20}$ alkyl group, a phenyl group, a deuterated phenyl group, a ($C_1$-$C_{20}$ alkyl)phenyl group, a biphenyl group, a deuterated biphenyl group, or a ($C_1$-$C_{20}$ alkyl)biphenyl group.

In one or more embodiments, in Formula 7F, $Ar_{74}$ and $Ar_{75}$ may each independently be a benzene group unsubstituted or substituted with deuterium, a $C_1$-$C_{20}$ alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl)biphenyl group, or any combination thereof, and $R_{74}$ and $R_{76}$ may each independently be $R_{74}$ may be hydrogen, deuterium, a $C_1$-$C_{20}$ alkyl group, a phenyl group, a deuterated phenyl group, a ($C_1$-$C_{20}$ alkyl) phenyl group, a biphenyl group, a deuterated biphenyl group, or a ($C_1$-$C_{20}$ alkyl)biphenyl group.

In one or more embodiments, a group represented by

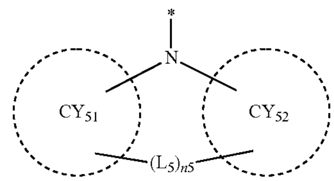

in Formula 5, a group represented by

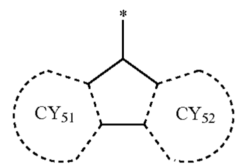

in Formula 5(1), and a group represented by

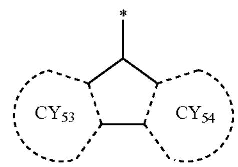

in Formula 5(1) may each independently be a group represented by one of Formulae 2-1 to 2-93:
2-1
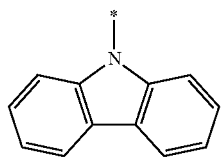
2-2
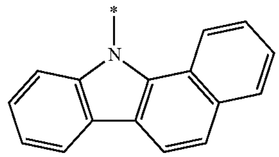
2-3
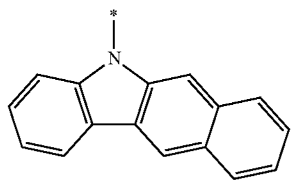
2-4
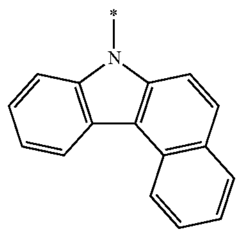
2-5
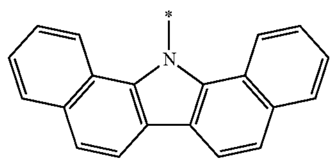
2-6
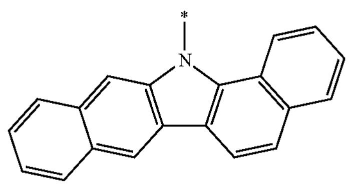
2-7
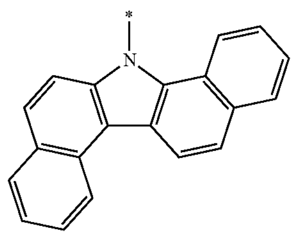
2-8
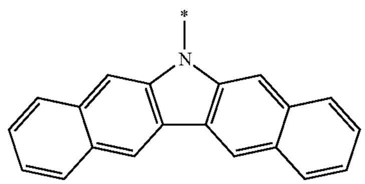
-continued
2-9
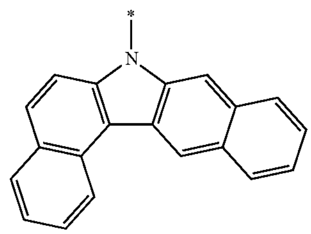
2-10
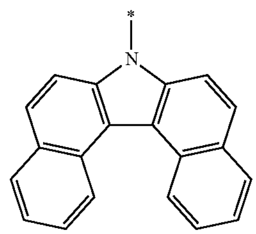
2-11
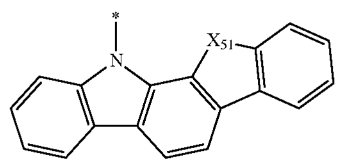
2-12
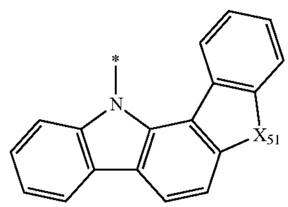
2-13
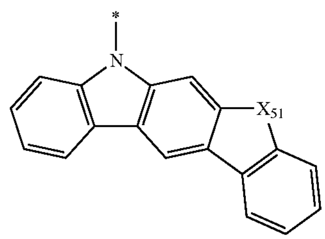
2-14
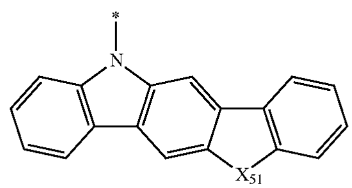
2-15
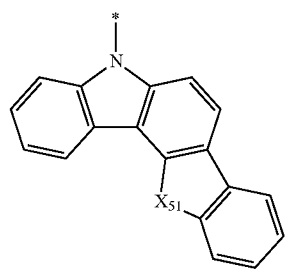

-continued
2-16
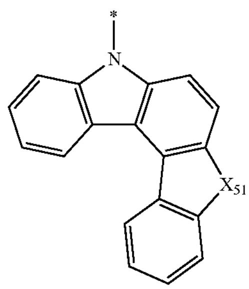
2-17
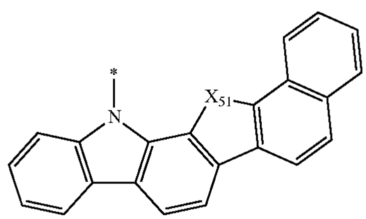
2-18
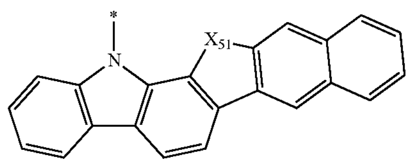
2-19
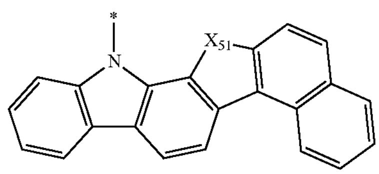
2-20
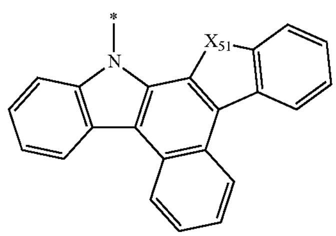
2-21
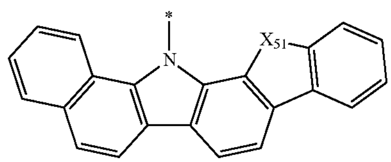
2-22
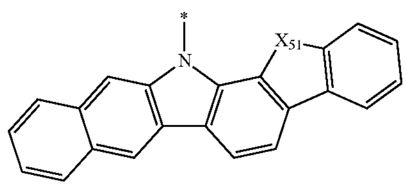
-continued
2-23
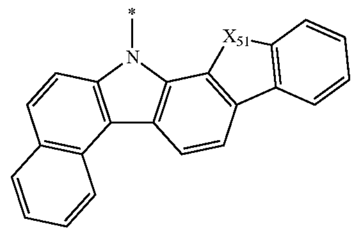
2-24
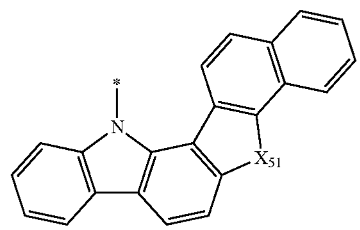
2-25
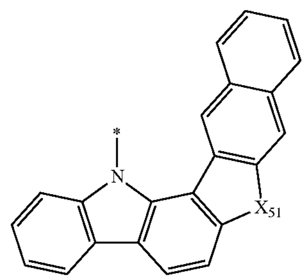
2-26
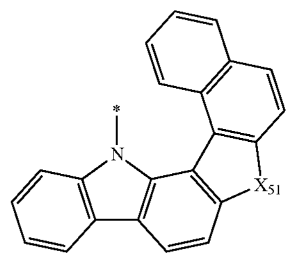
2-27
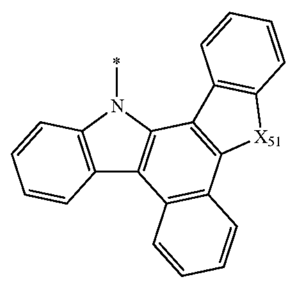
2-28
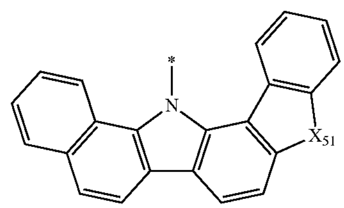

-continued
2-29
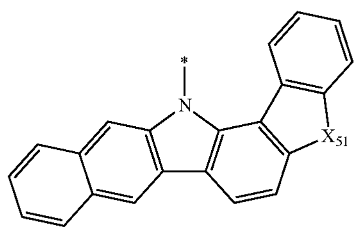
2-30
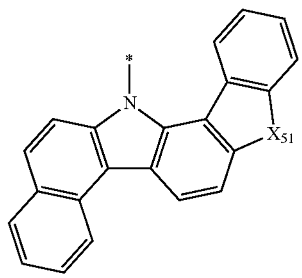
2-31
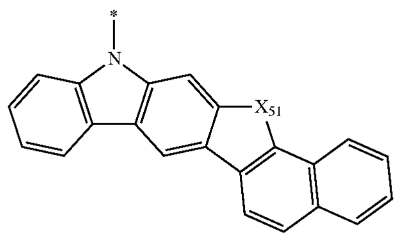
2-32
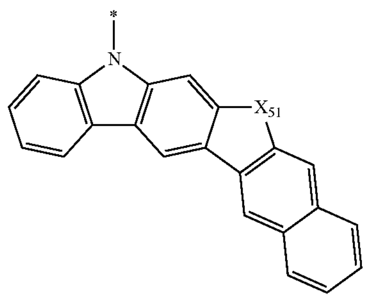
2-33
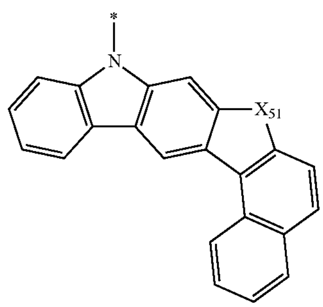
2-34
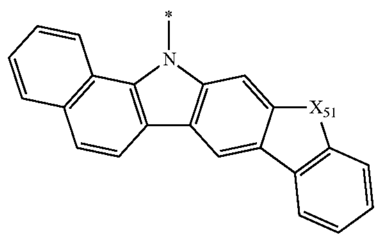
-continued
2-35
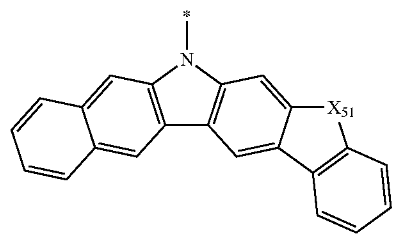
2-36
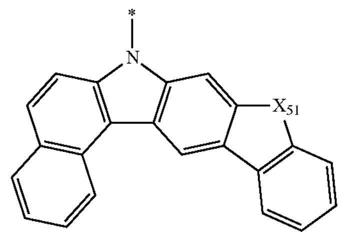
2-37
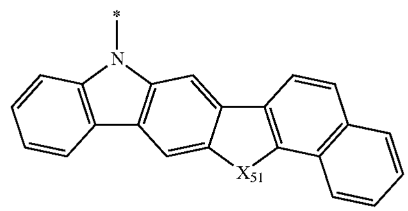
2-38
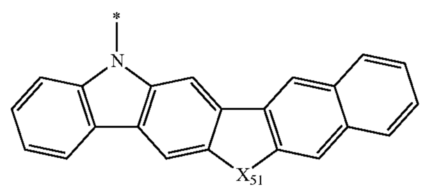
2-39
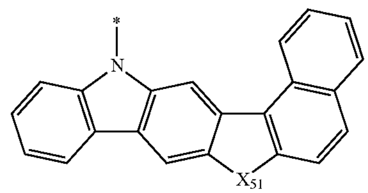
2-40
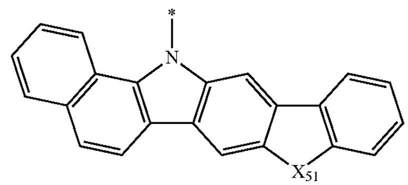
2-41
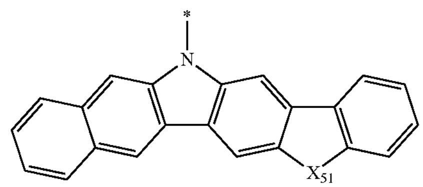

-continued
2-42
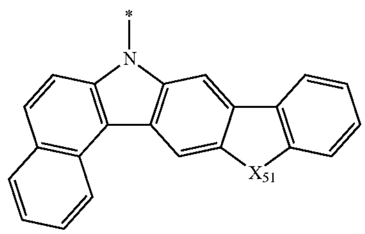
2-43
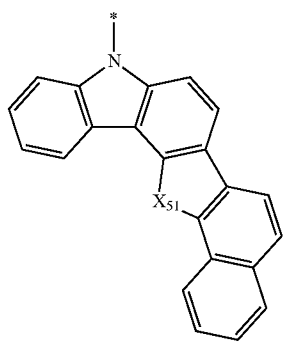
2-44
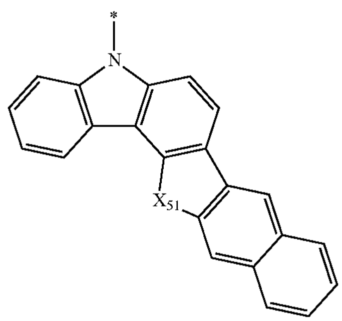
2-45
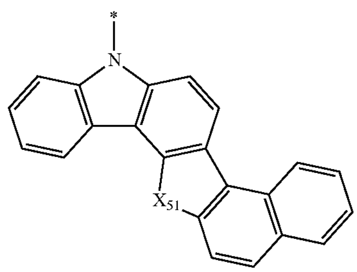
2-46
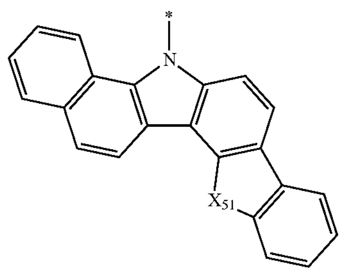
-continued
2-47
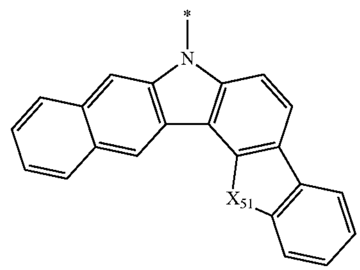
2-48
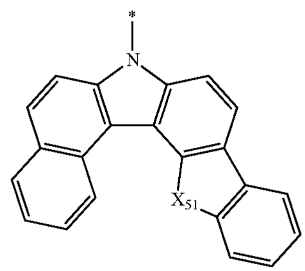
2-49
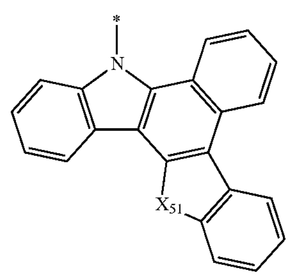
2-50
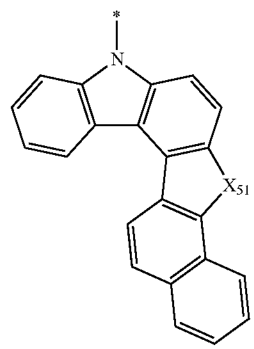
2-51
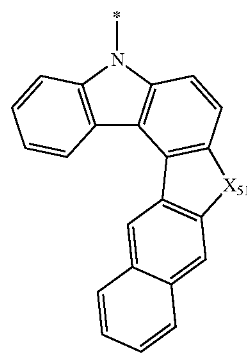

-continued
2-52
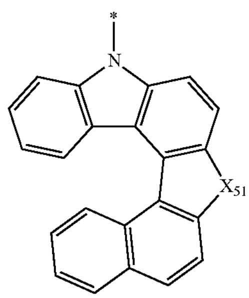
2-53
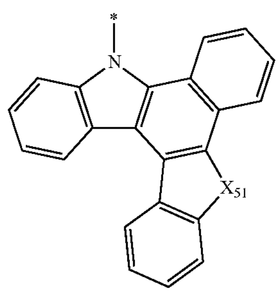
2-54
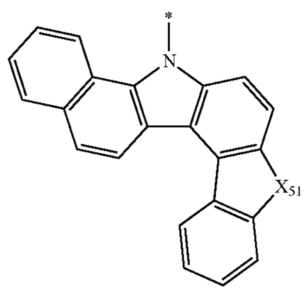
2-55
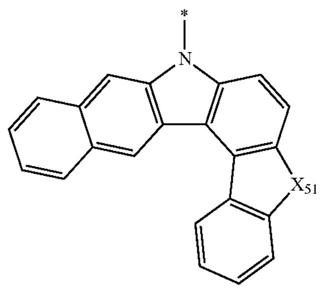
2-56
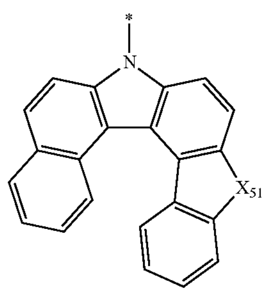
-continued
2-57
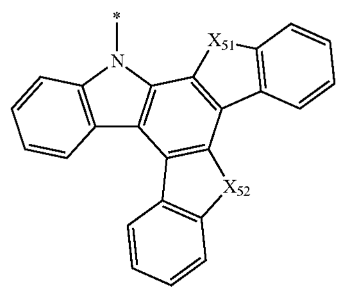
2-58
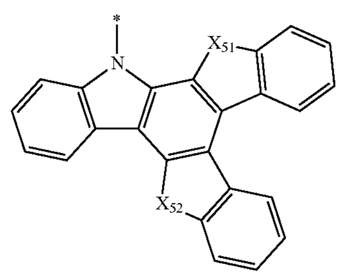
2-59
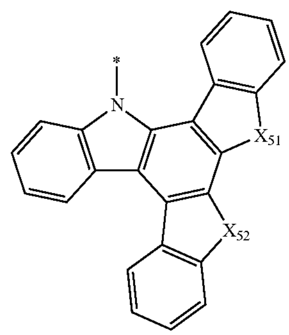
2-60
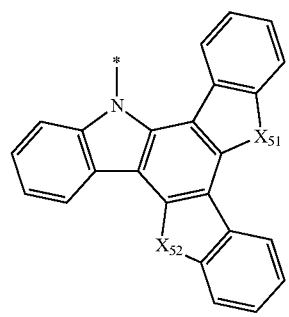
2-61
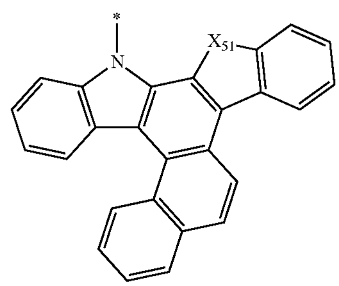

-continued
2-62
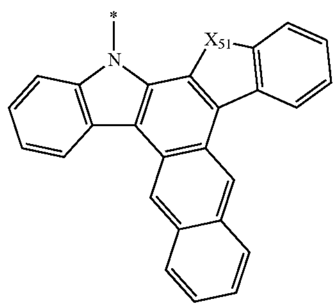
2-63
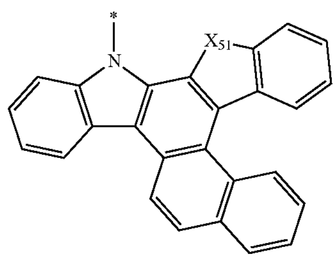
2-64
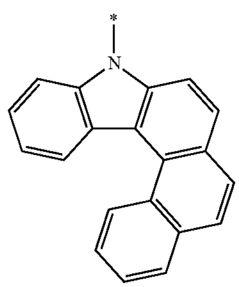
2-65
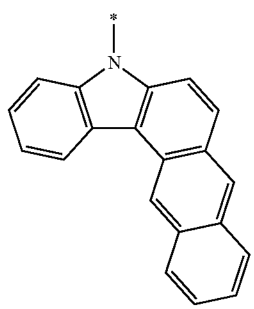
2-66
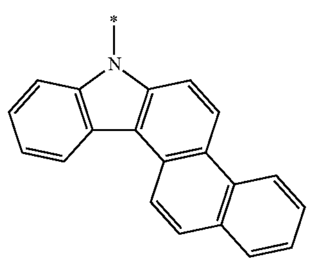
2-67
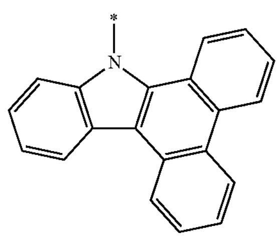
-continued
2-68
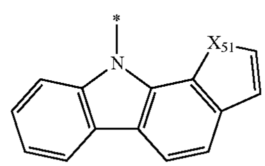
2-69
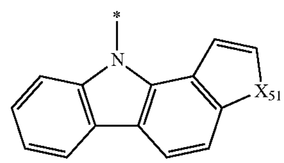
2-70
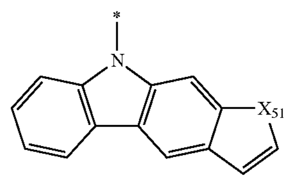
2-71
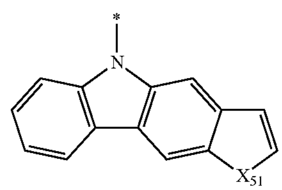
2-72
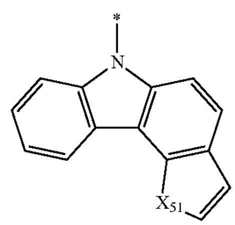
2-73
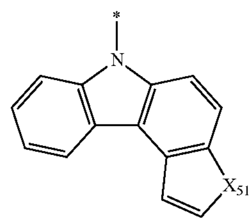
2-74
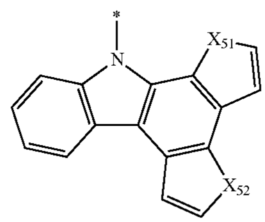
2-75
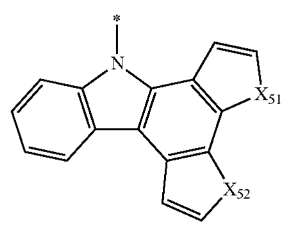

2-76
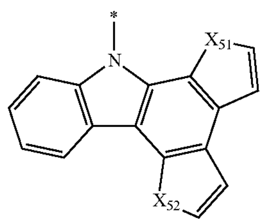
2-77
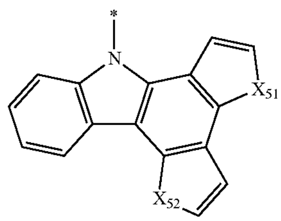
2-78
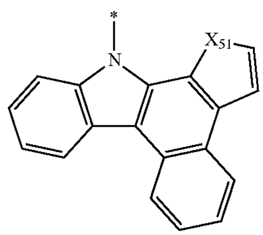
2-79
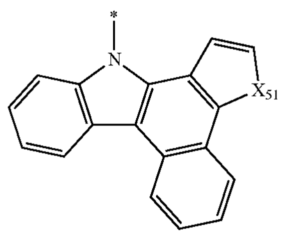
2-80
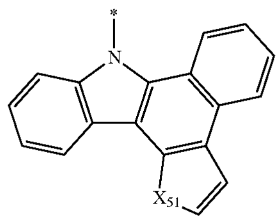
2-81
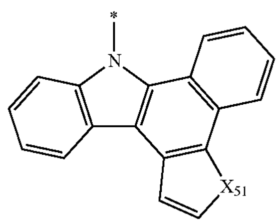
2-82
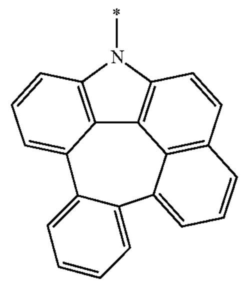
2-83
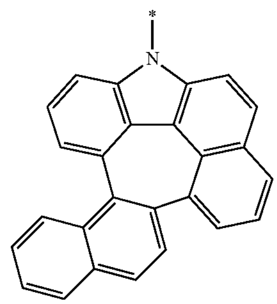
2-84
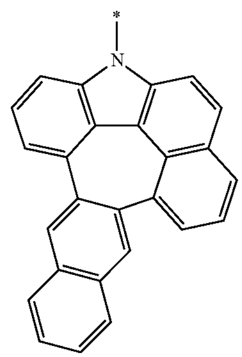
2-85
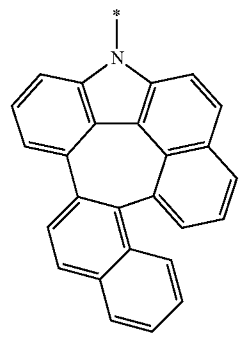
2-86
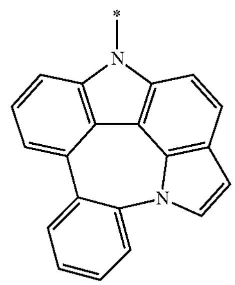

-continued 2-87

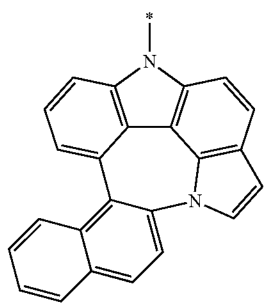

2-88

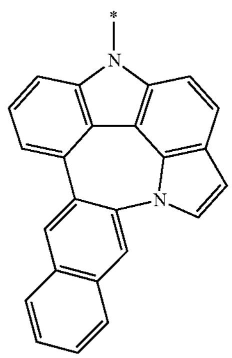

2-89

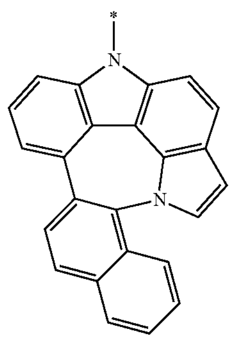

2-90

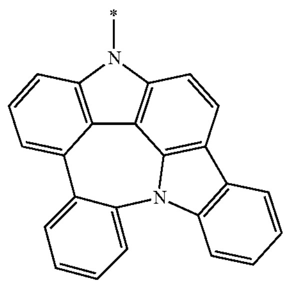

2-91

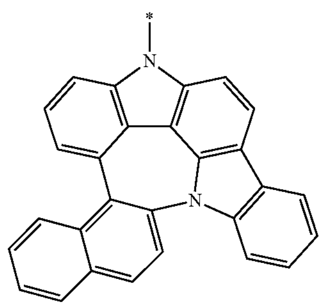

-continued 2-92

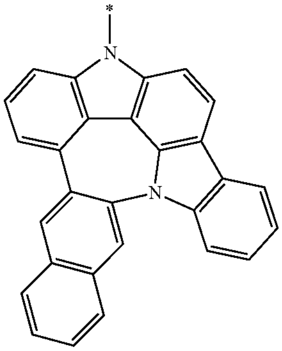

2-93

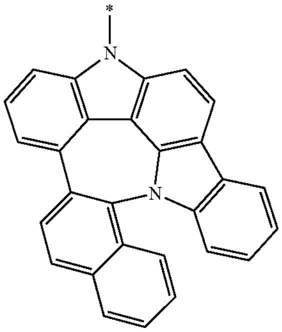

wherein, in Formulae 2-1 to 2-93, $X_{51}$ may be O, S, $N(R_{51a})$, $C(R_{51a})(R_{51b})$, or $Si(R_{51a})(R_{51b})$, $X_{52}$ may be O, S, $N(R_{52a})$, $C(R_{52a})(R_{52b})$, or $Si(R_{52a})(R_{52b})$, $R_{51a}$, $R_{51b}$, $R_{52a}$, and $R_{52b}$ may each be understood by referring to the descriptions of $R_{51}$ provided herein, and

* indicates a binding site to $Ar_1$ or $Ar_3$.

In one or more embodiments, Het1 in Formula 7 and Het1 and Het3 in Formula 7(1) may each independently be a group derived from one of Formulae 3-1 to 3-40:

3-1

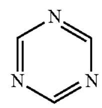

3-2

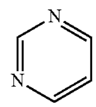

3-3

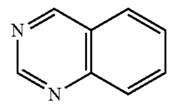

3-4

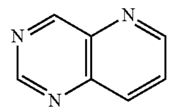

3-5

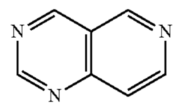

-continued
3-6
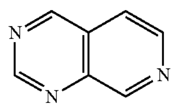
3-7
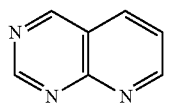
3-8
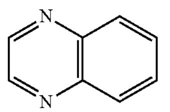
3-9
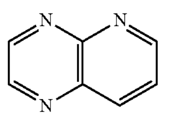
3-10
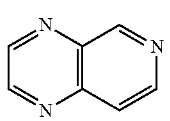
3-11
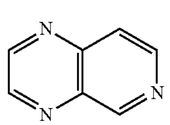
3-12
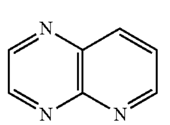
3-13
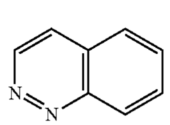
3-14
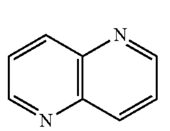
3-15
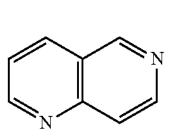
3-16
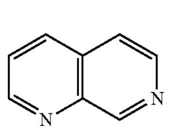
3-17
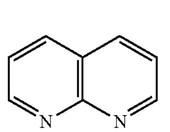
3-18
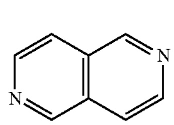
-continued
3-19
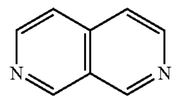
3-20
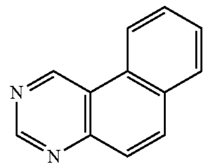
3-21
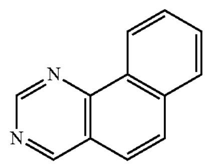
3-22
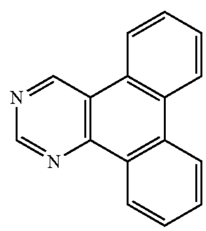
3-23
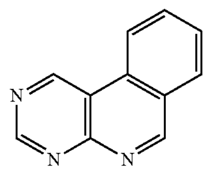
3-24
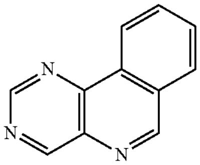
3-25
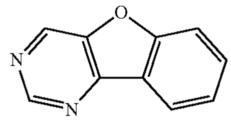
3-26
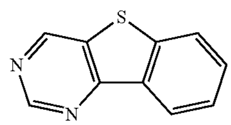
3-27
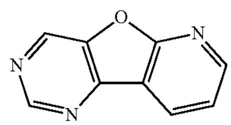
3-28
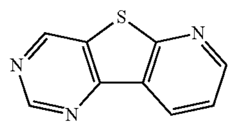

-continued 3-29

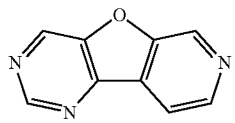

3-30

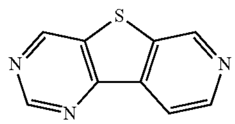

3-31

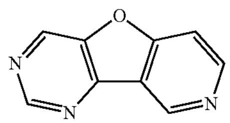

3-32

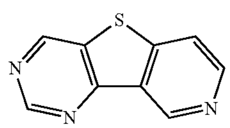

3-33

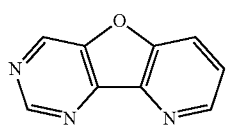

3-34

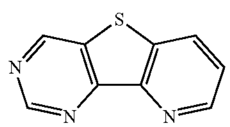

3-35

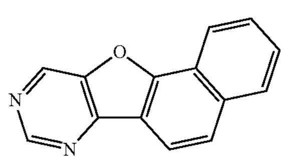

3-36

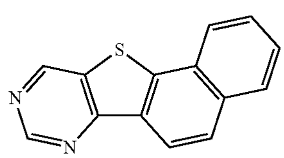

3-37

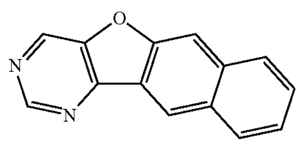

3-38

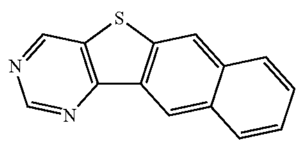

3-39

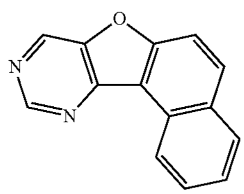

-continued 3-40

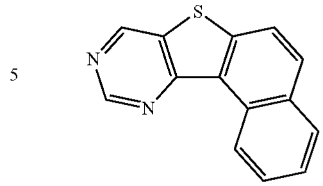

.

In Formulae 5 and 5(1), a1 and a2 respectively indicate the number of $Ar_1$(s) and $Ar_2$(s). a1 and a2 may each independently be an integer from 0 to 5 (e.g., 0, 1, or 2), and the sum of a1 and a2 may be 1 or greater. When a1 is two or greater, at least two $Ar_1$(s) may be identical to or different from each other, and when a2 is two or greater, at least two $Ar_2$(s) may be identical to or different from each other. When a1 is 0, $*-(Ar_1)_{a1}-*'$ in in Formula 2 may be a single bond.

In Formulae 7 and 7(1), a11 and m may respectively indicate the number of $Ar_{11}$(s) and $*-(Ar_{11})_{a11}-(R_{70})_{a70}$(s). a11 and m may each independently be an integer from 1 to 10. When a11 is 2 or greater, at least two $Ar_{11}$(s) may be identical to or different from each other. When m is 2 or greater, at least two $*-(Ar_{11})_{a11}-(R_{70})_{a70}$(s) may be identical to or different from each other.

In an embodiment, in Formulae 7 and 7(1), a11 and m may each independently be an integer from 1 to 3.

$R_{50}$ to $R_{54}$, $R_{50a}$ to $R_{50d}$, $R_{51a}$, $R_{51b}$, $R_{52a}$, $R_{52b}$, $R_{70}$, $R_{73}$, $R_{80}$, and $R_{83}$ may each independently be hydrogen, deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$. $Q_1$ to $Q_9$ may respectively be understood by referring to the descriptions of $Q_1$ to $Q_9$ provided herein.

For example, $R_{50}$ to $R_{54}$, $R_{50a}$ to $R_{50d}$, $R_{51a}$, $R_{51b}$, $R_{52a}$, $R_{52b}$, $R_{70}$, $R_{73}$, $R_{80}$, and $R_{83}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group (norbornanyl group), a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$, wherein $Q_1$ to $Q_9$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$, or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or any combination thereof.

b51 to b54, b7, b73, b8, and b83 may respectively indicate the number of $R_{50}$(s) to $R_{54}$(s), $R_{70}$(s), $R_{73}$(s), $R_{80}$(s), and $R_{83}$(s), and b51 to b54, b7, b73, b8, and b83 may each independently be an integer from 0 to 20. For example, b51 to b54, b7, b73, b8, and b83 may each independently be an integer from 0 to 10. When b51 is 2 or greater, at least two $R_{51}$(s) may be identical to or different from each other. When b52 is 2 or greater, at least two $R_{52}$(s) may be identical to or different from each other. When b53 is 2 or greater, at least two $R_{53}$(s) may be identical to or different from each other. When b54 is 2 or greater, at least two $R_{54}$(s) may be identical to or different from each other. When b7 is 2 or greater, at least two $R_{70}$(s) may be identical to or different from each other. When b73 is 2 or greater, at least two $R_{73}$(s) may be identical to or different from each other. When b8 is 2 or greater, at least two $R_{80}$(s) may be identical to or different from each other. When b83 is 2 or greater, at least two $R_{83}$(s) may be identical to or different from each other.

For example, $R_{50}$ to $R_{54}$, $R_{50a}$ to $R_{50d}$, $R_{51a}$, $R_{51b}$, $R_{52a}$, $R_{52b}$, $R_{70}$, $R_{73}$, $R_{80}$, and $R_{83}$ may each independently be:

hydrogen or deuterium;

a $C_1$-$C_{20}$ alkyl group or a $C_1$-$C_{20}$ alkoxy group, each unsubstituted or substituted with deuterium, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, —N($Q_{31}$)($Q_{32}$), or any combination thereof;

a π electron-rich $C_3$-$C_{60}$ cyclic group, unsubstituted or substituted with deuterium, a $C_1$-$C_{20}$ alkyl group, a $C_1$-$C_{20}$ alkoxy group, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, —N($Q_{31}$)($Q_{32}$), or any combination thereof; or —N($Q_1$)($Q_2$).

$Q_1$, $Q_2$, $Q_{31}$, and $Q_{32}$ may respectively be understood by referring to the descriptions of $Q_1$, $Q_2$, $Q_{31}$, and $Q_{32}$ provided herein.

In some embodiments, $R_{50}$ to $R_{54}$, $R_{50a}$ to $R_{50d}$, $R_{51a}$, $R_{51b}$, $R_{52a}$, $R_{52b}$, $R_{70}$, $R_{73}$, $R_{80}$, and $R_{83}$ may each independently be:

hydrogen or deuterium;

a $C_1$-$C_{20}$ alkyl group unsubstituted or substituted with deuterium, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, —N($Q_{31}$)($Q_{32}$), or any combination thereof; or a phenyl group, a naphthyl group, an anthracenyl group, a phenanthrenyl group, a triphenylenyl group, a fluorenyl group, a dibenzosilolyl group, a carbazolyl group, a dibenzofuranyl group, or a dibenzothiophenyl group, each unsubstituted or substituted with deuterium, a $C_1$-$C_{20}$ alkyl group, a $C_1$-$C_{20}$ alkoxy group, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, or any combination thereof.

$Q_{31}$ and $Q_{32}$ may respectively be understood by referring to the descriptions of $Q_{31}$ and $Q_{32}$ provided herein.

In Formulae 5 and 7, 1) at least two $R_{51}$(s) may optionally be bound to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, 2) at least two $R_{52}$(s) may optionally be bound to from a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, and 3) at least two of ring $CY_{51}$, ring $CY_{52}$, $R_{51}$, and $R_{52}$ may optionally be bound to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$. $R_{10a}$ may be understood by referring to the description of $R_1$ provided herein.

Descriptions of Compounds

In an embodiment, the first dopant and the second dopant may each be one of compounds of Group 1-1 to Group 1-7:

Group 1-1

1

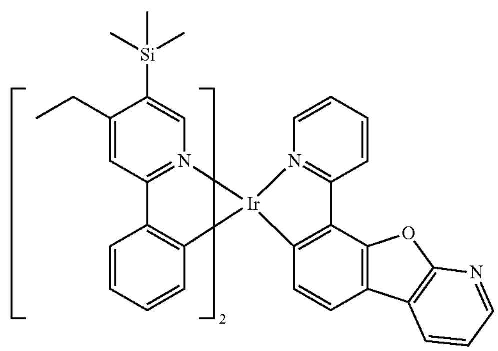

2

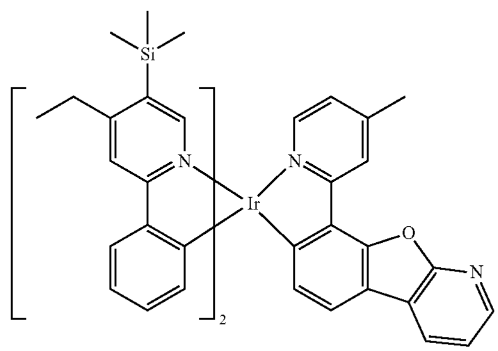

3

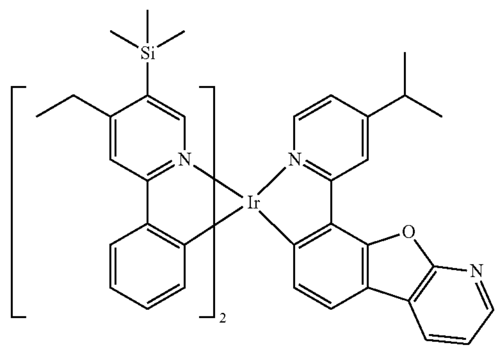

-continued
4
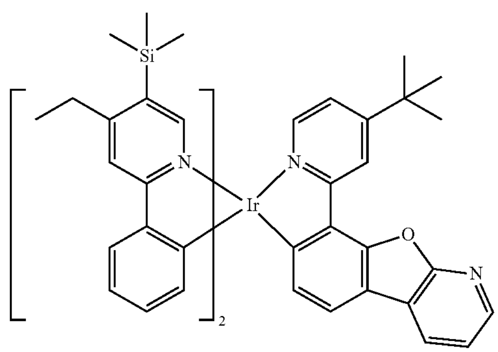
5
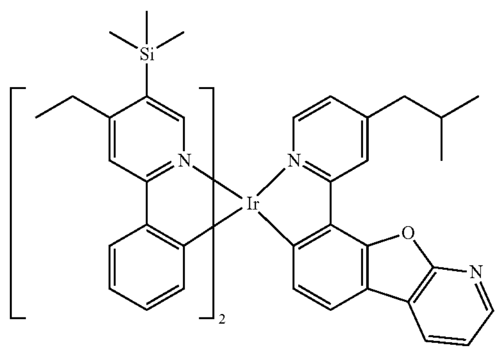
6
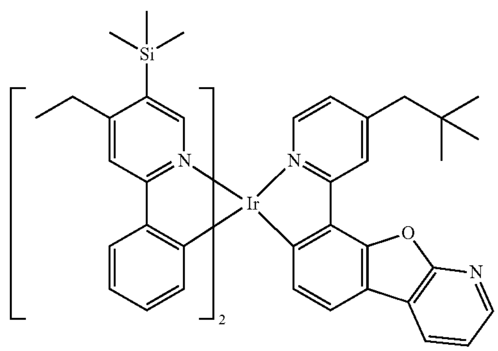
7
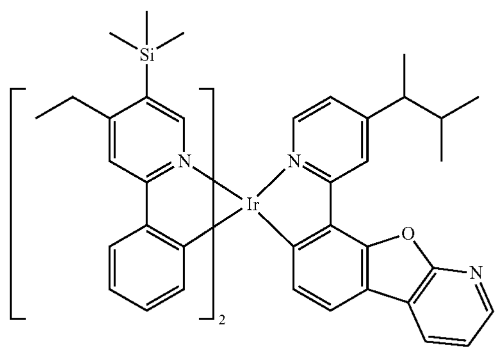
-continued
8
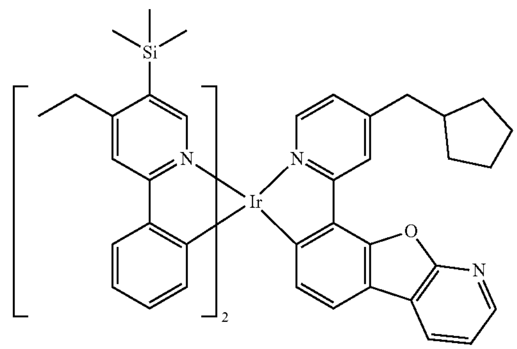
9
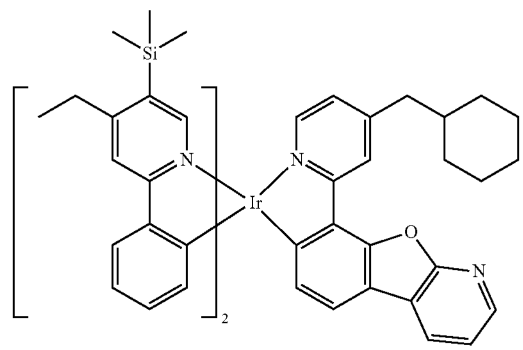
10
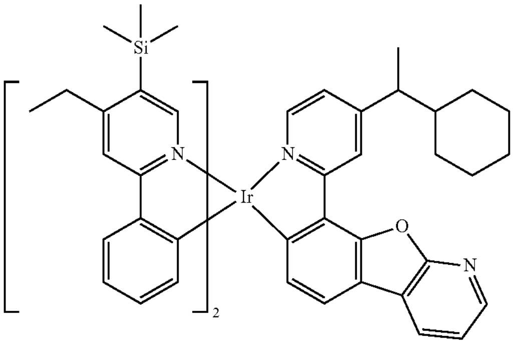
11
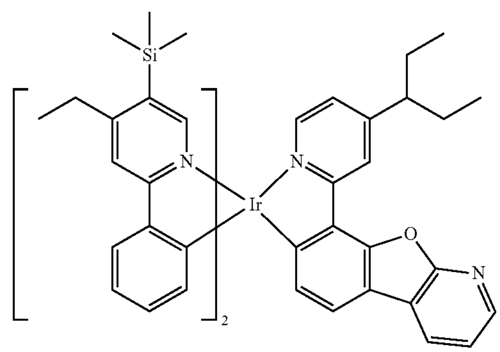

-continued
12
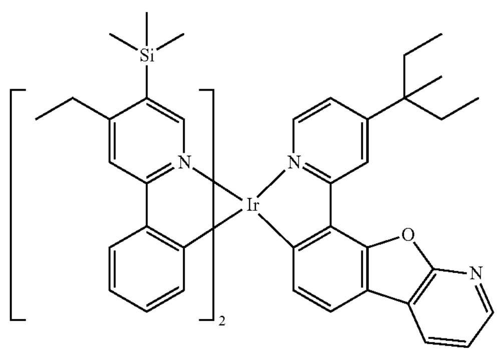
13
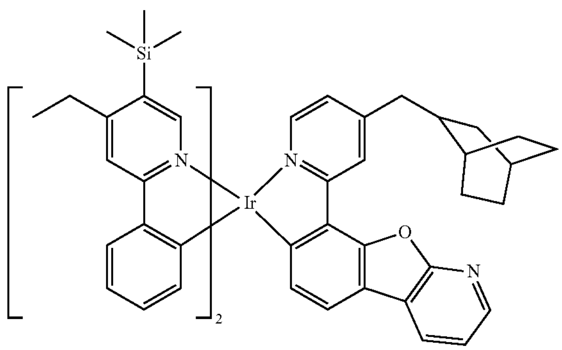
14
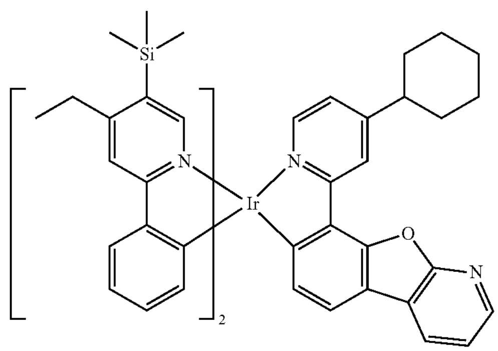
15
-continued
16
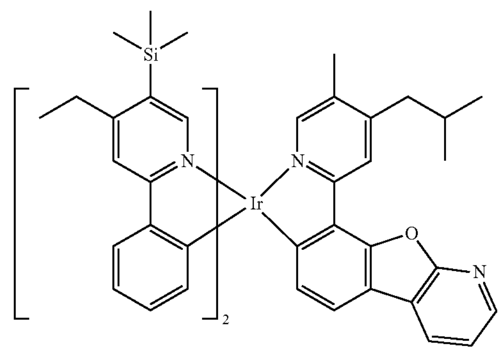
17
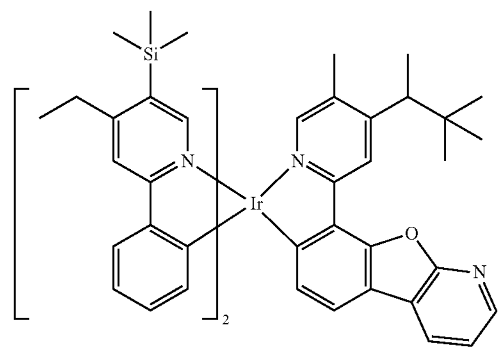
18
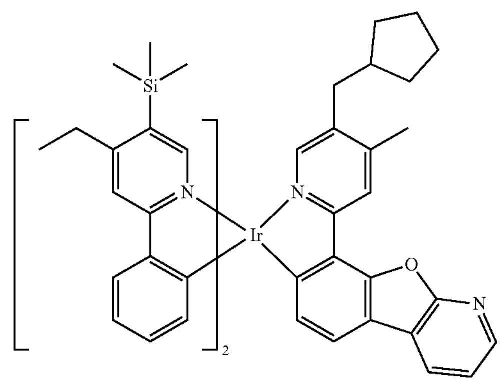
19
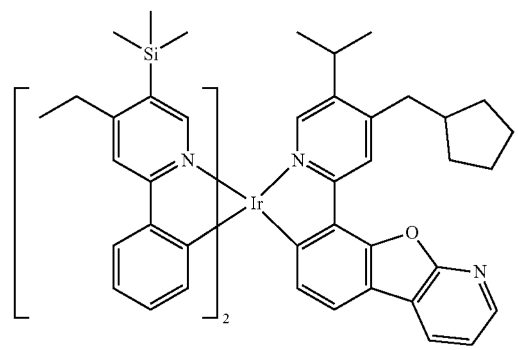

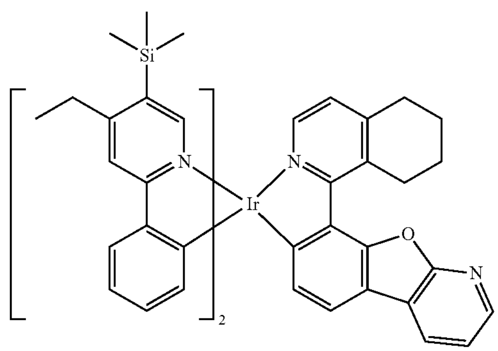
20
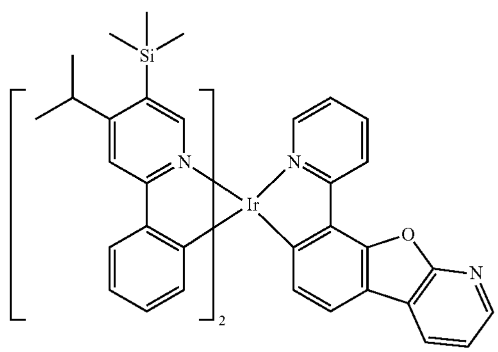
21
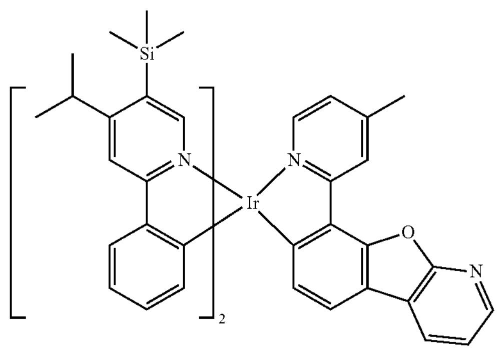
22
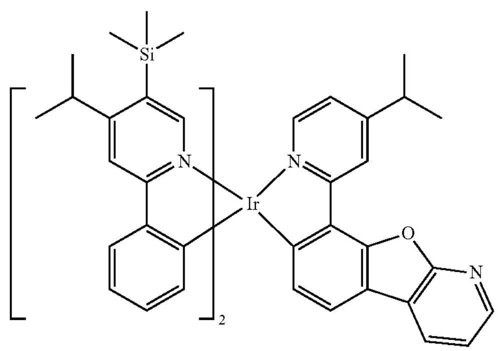
23
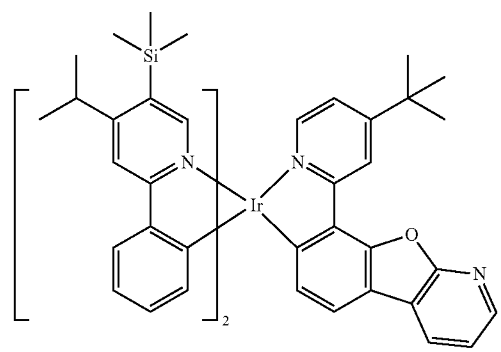
24
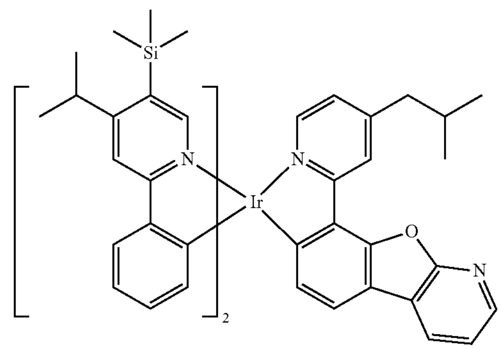
25
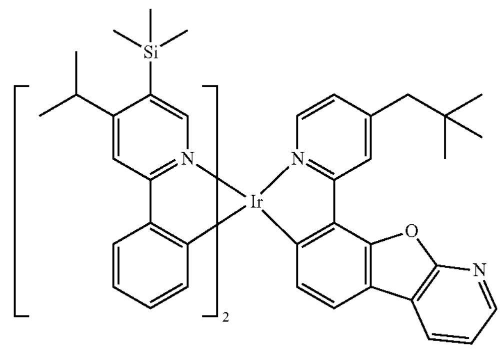
26
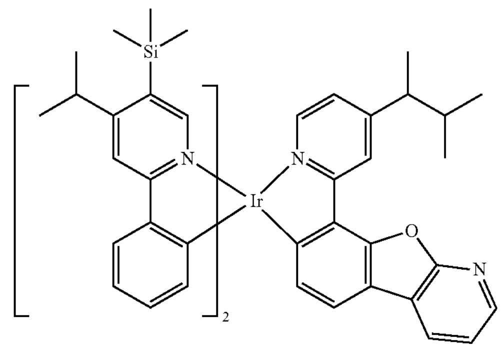
27

-continued
28
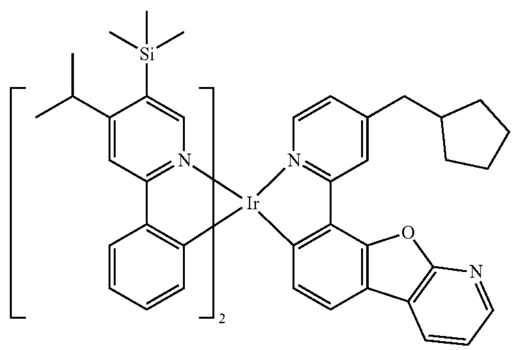
29
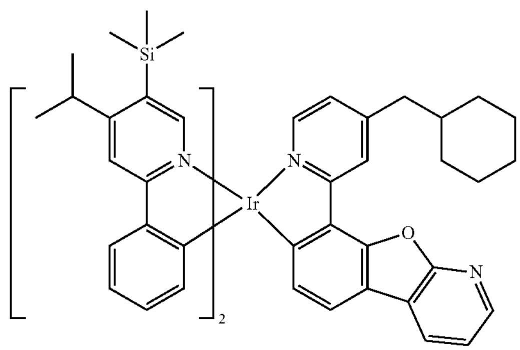
30
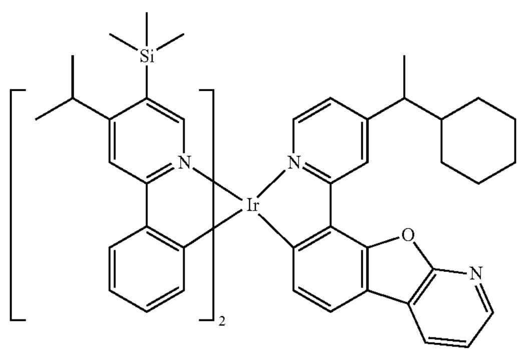
31
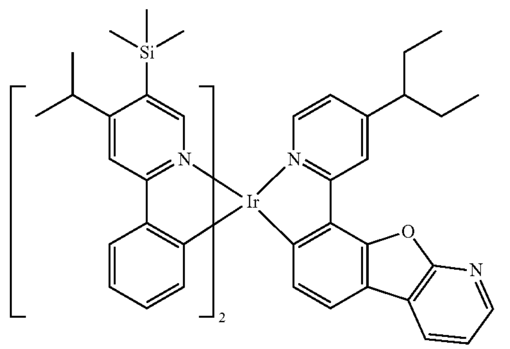
-continued
32
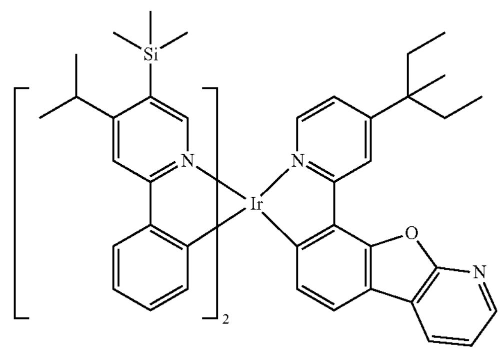
33
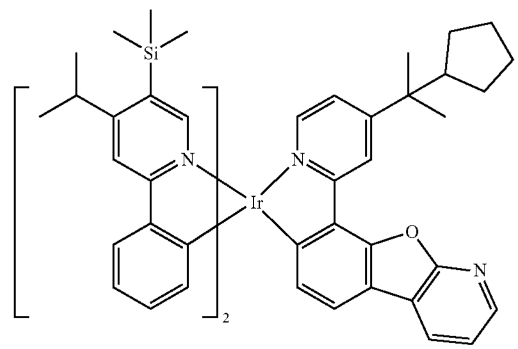
34
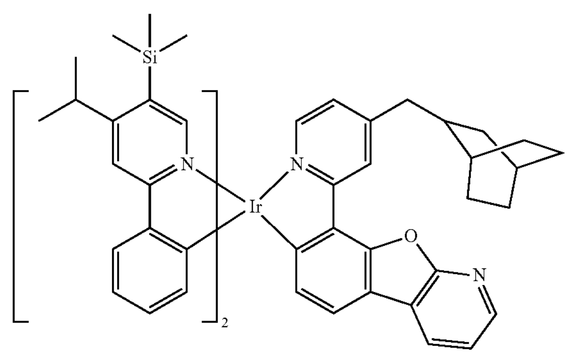
35
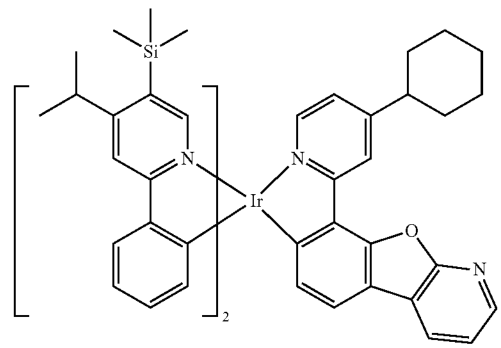

-continued
36
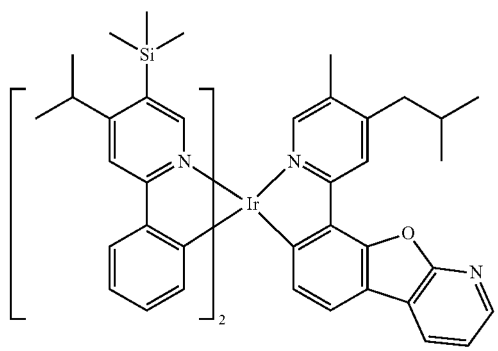
40
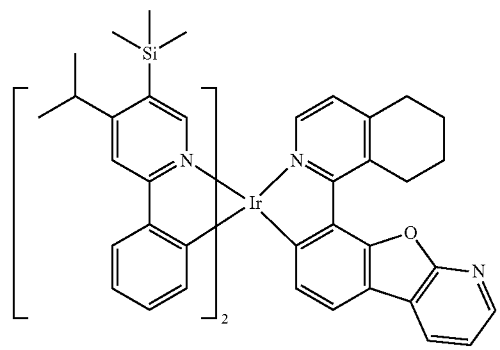
37
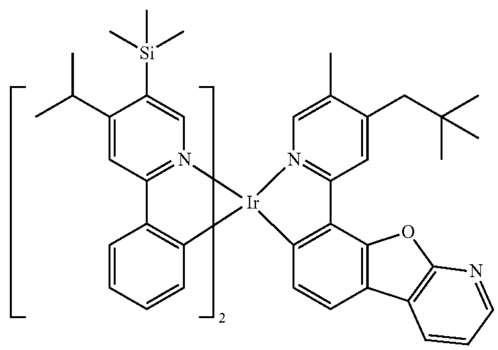
41
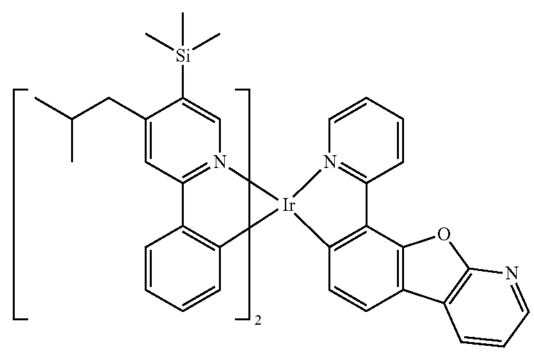
38
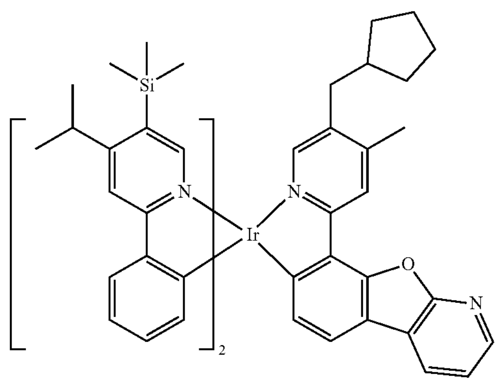
42
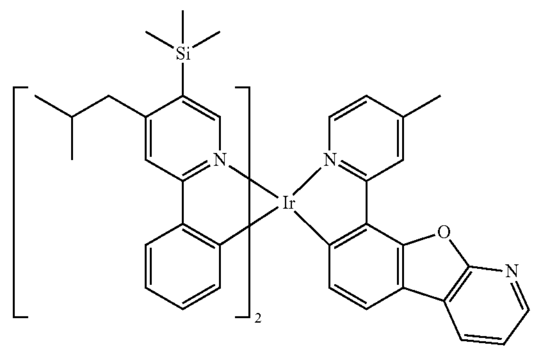
39
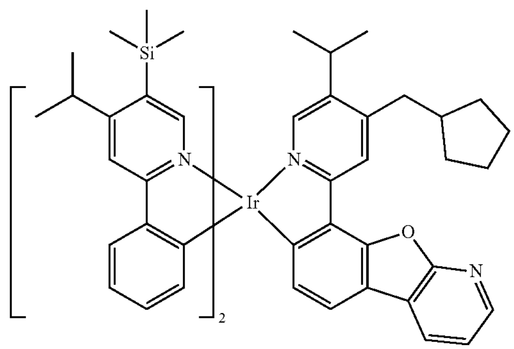
43
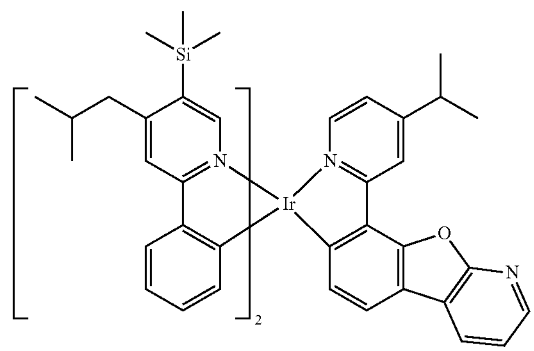

-continued
44
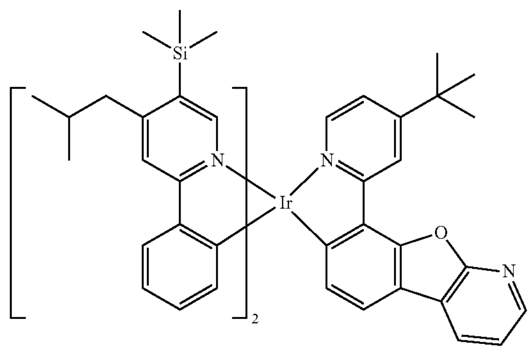
45
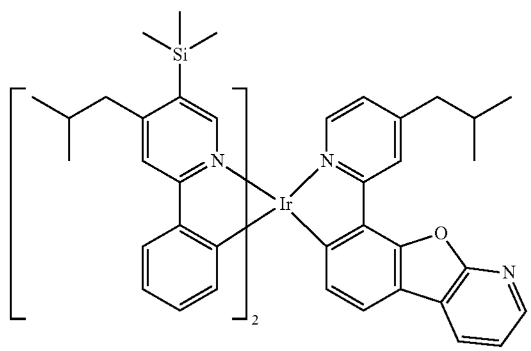
46
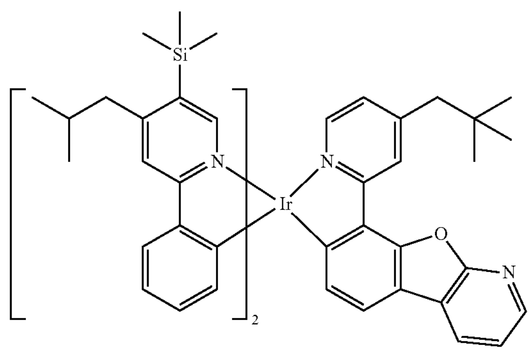
47
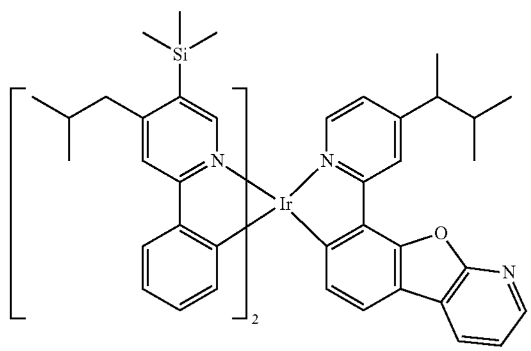
-continued
48
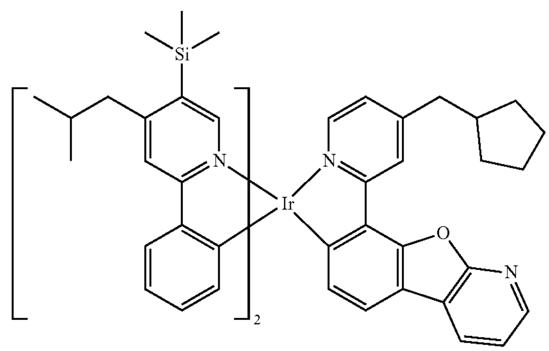
49
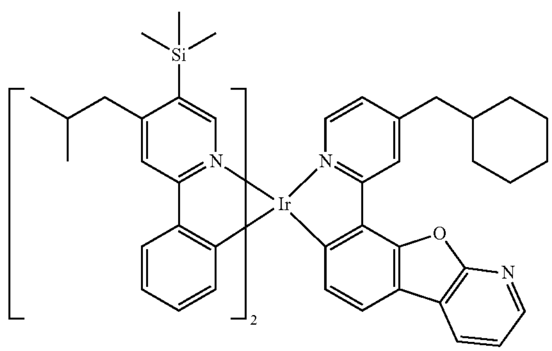
50
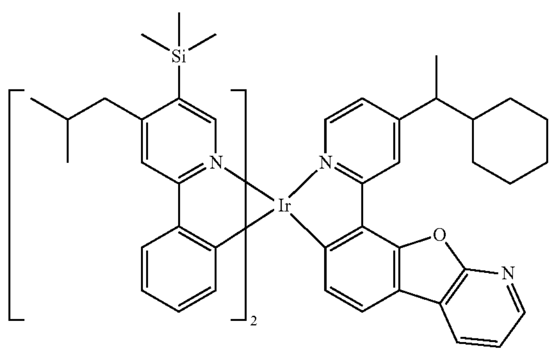
51
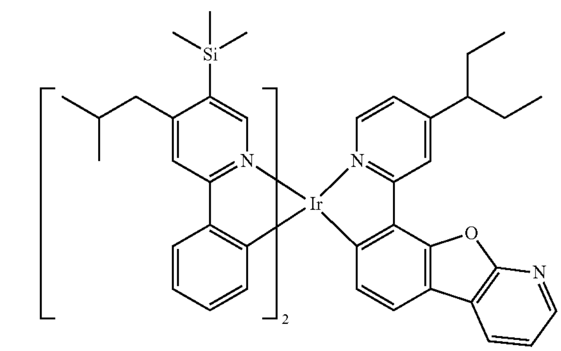

-continued
52
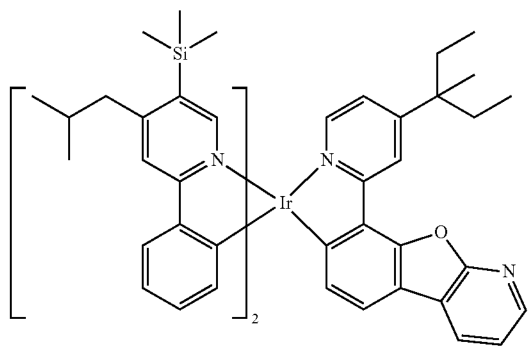
53
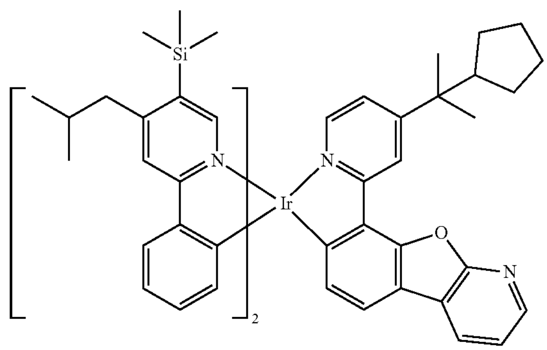
54
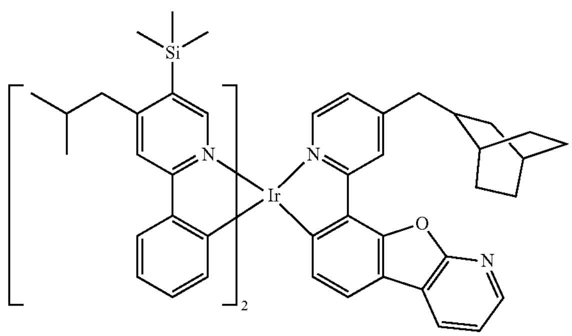
55
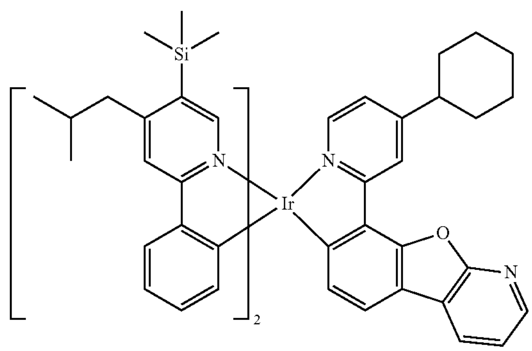
-continued
56
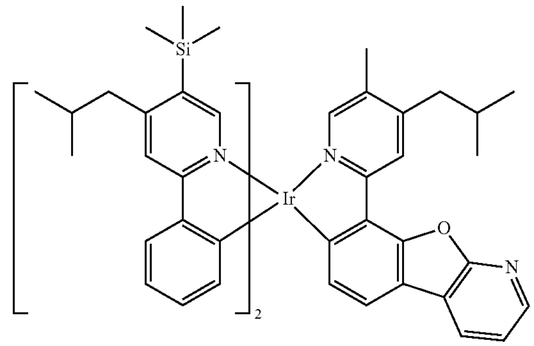
57
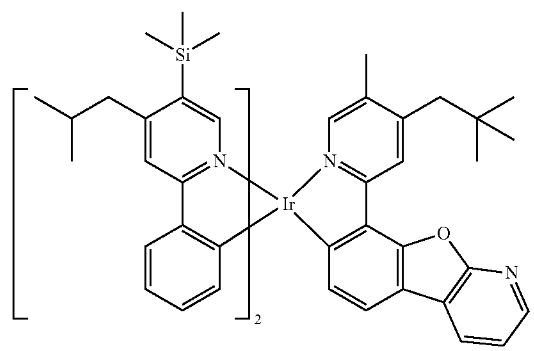
58
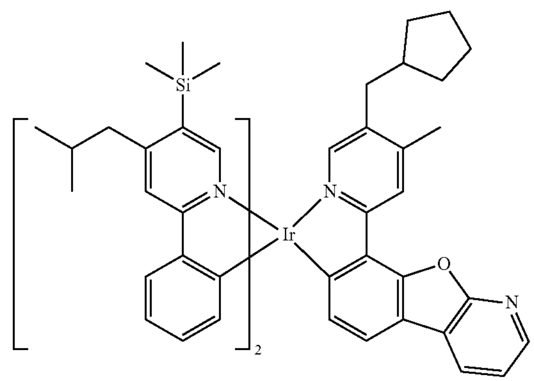
59
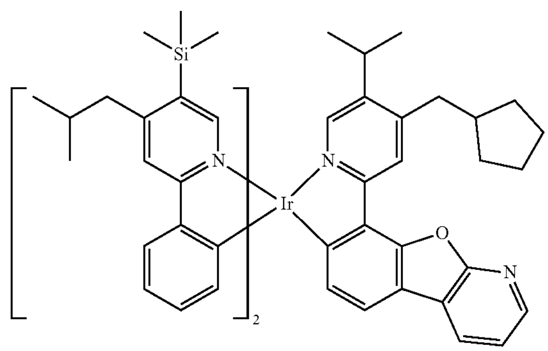

-continued
60
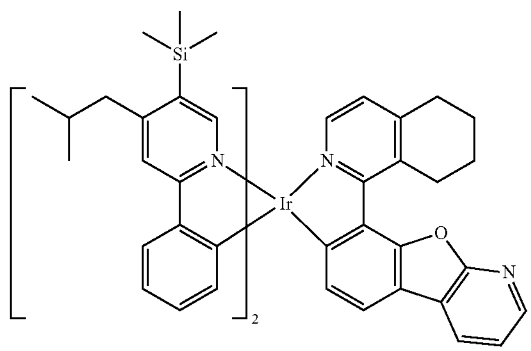
61
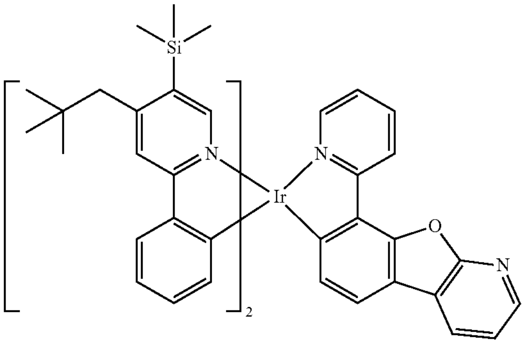
62
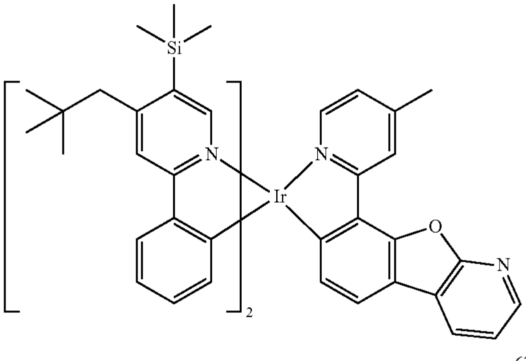
63
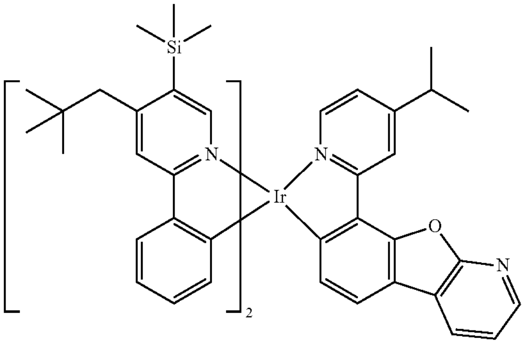
-continued
64
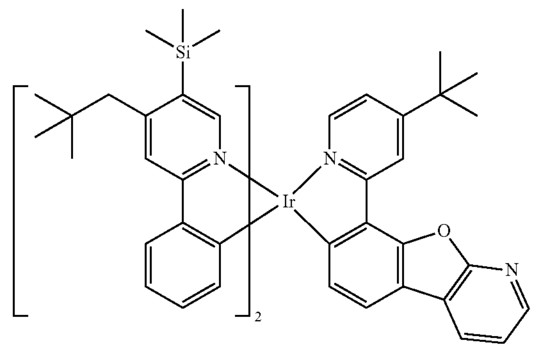
65
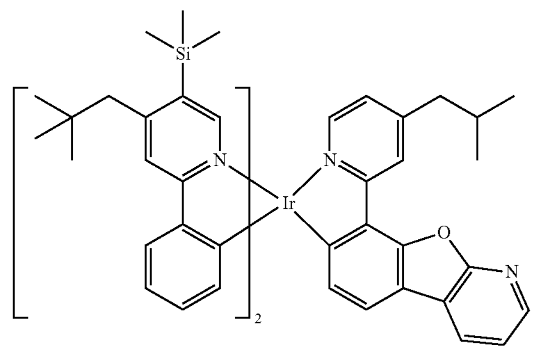
66
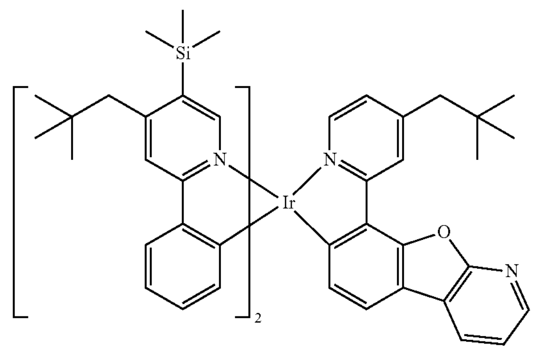
67
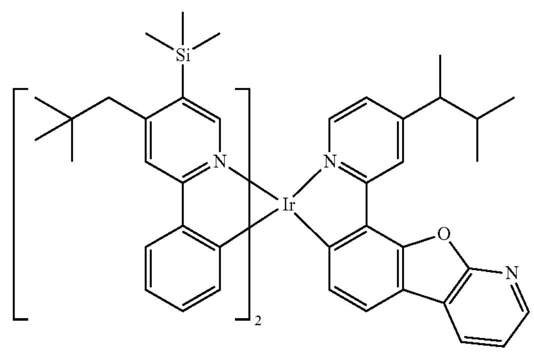

-continued
68
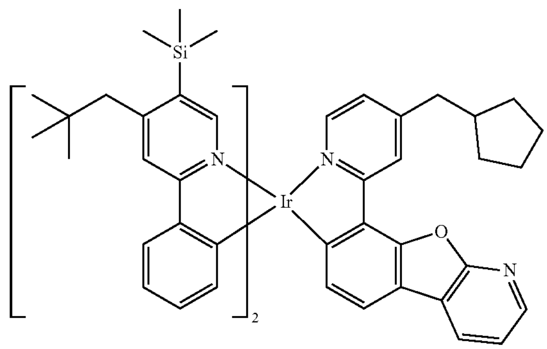
69
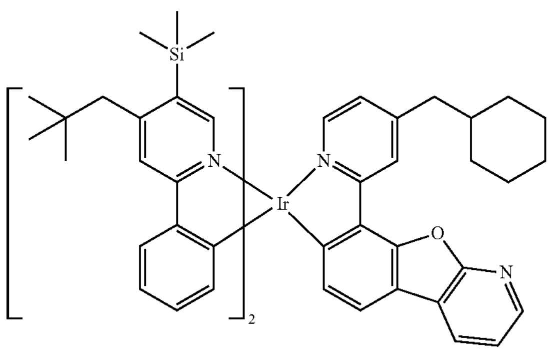
70
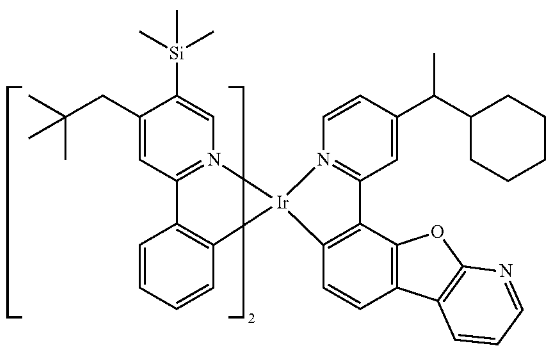
71
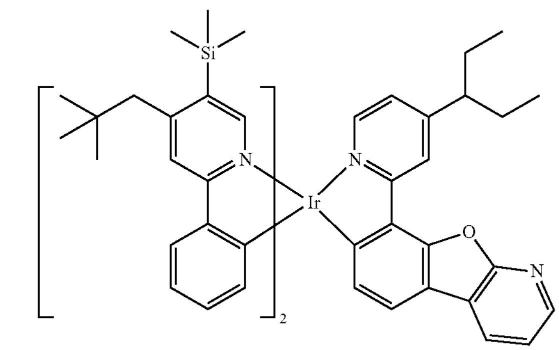
-continued
72
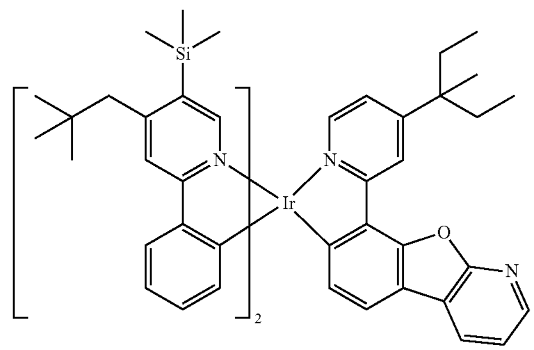
73
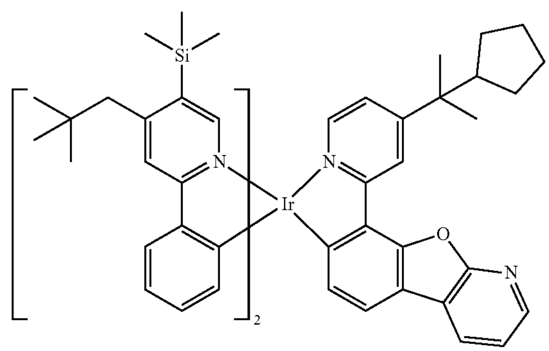
74
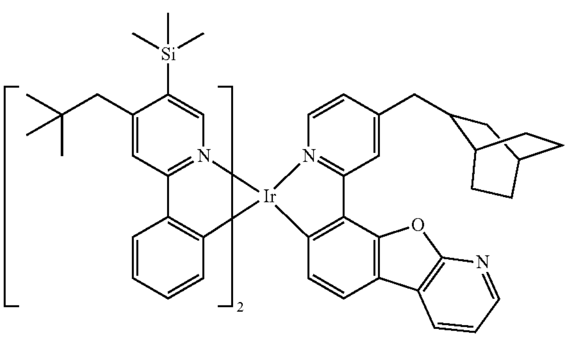
75
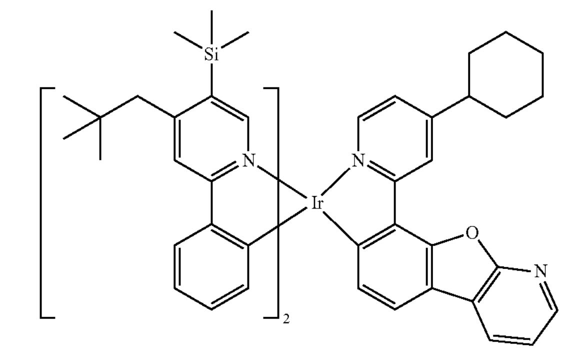

-continued
76
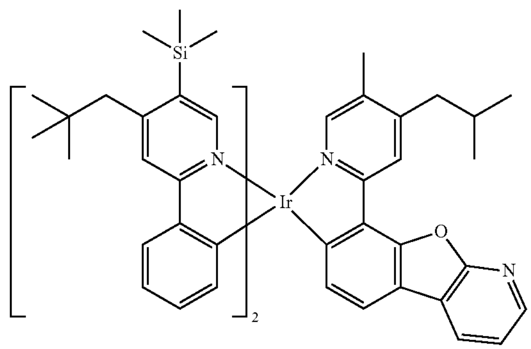
77
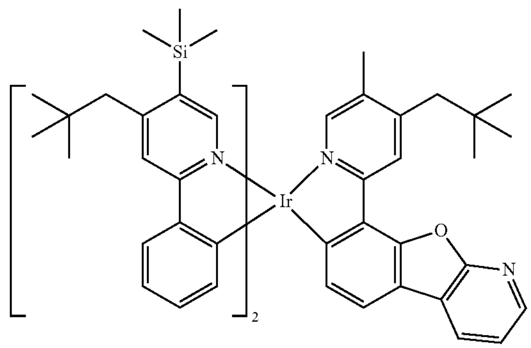
78
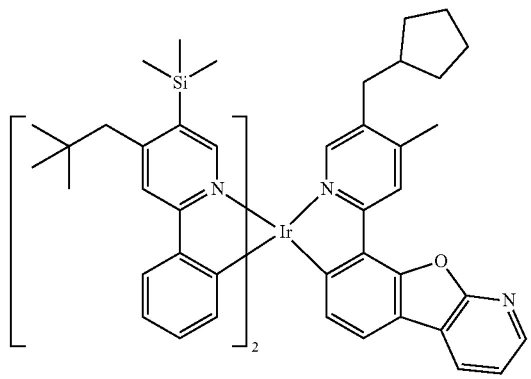
79
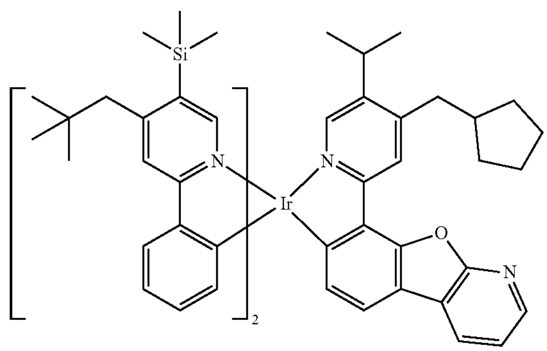
-continued
80
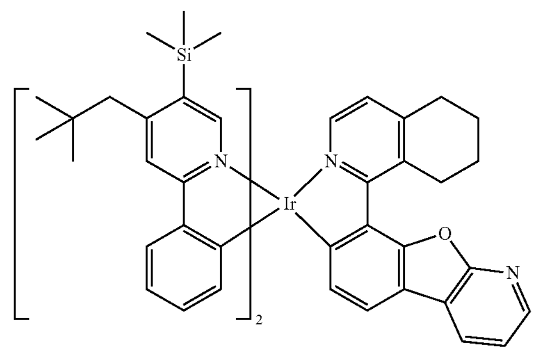
81
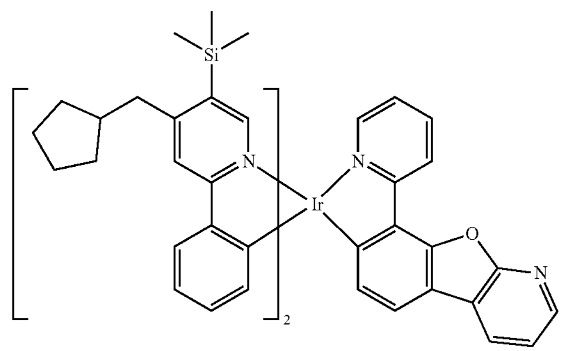
82
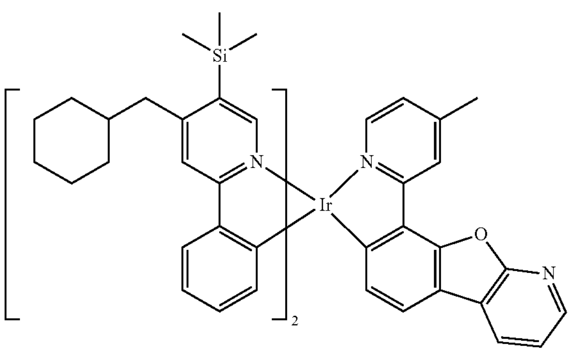
83
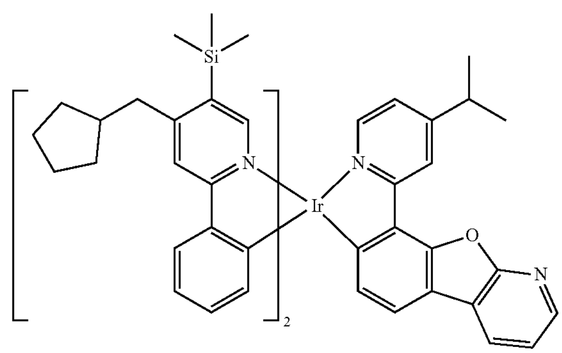

-continued
84
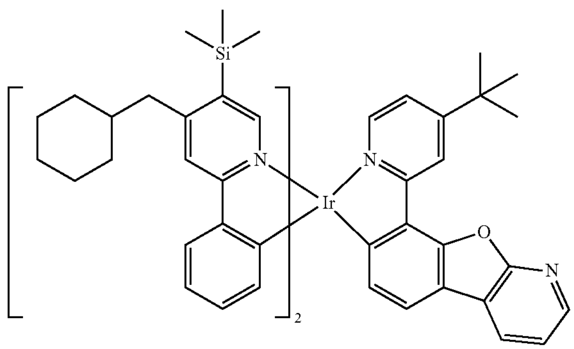
85
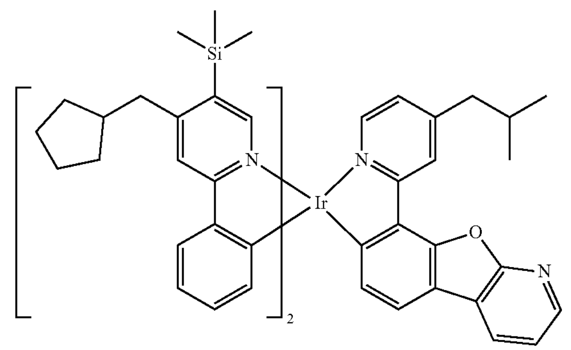
86
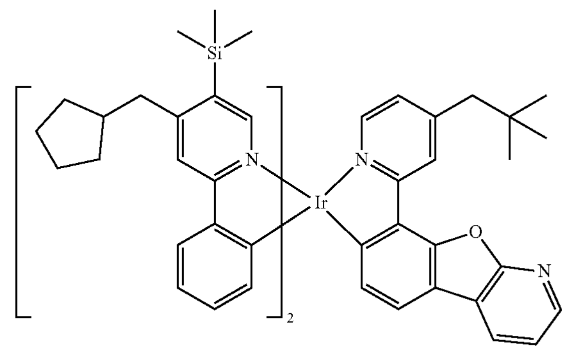
87
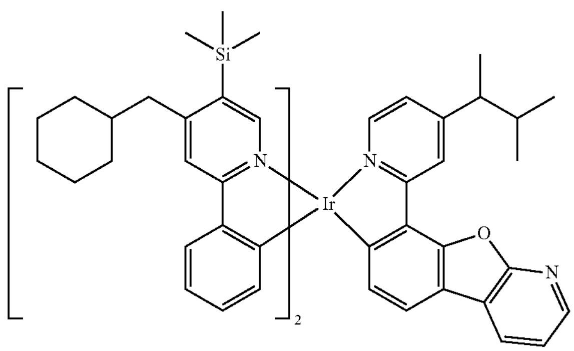
-continued
88
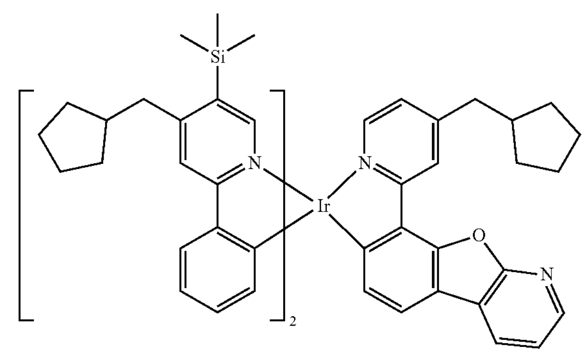
89
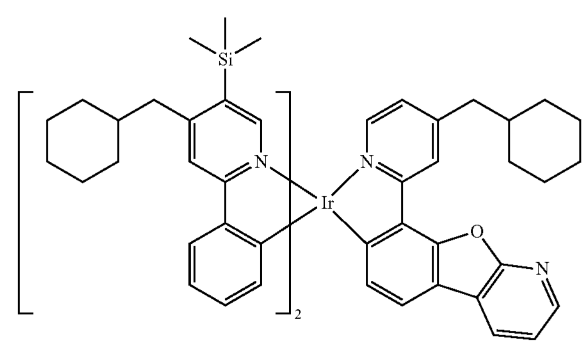
90
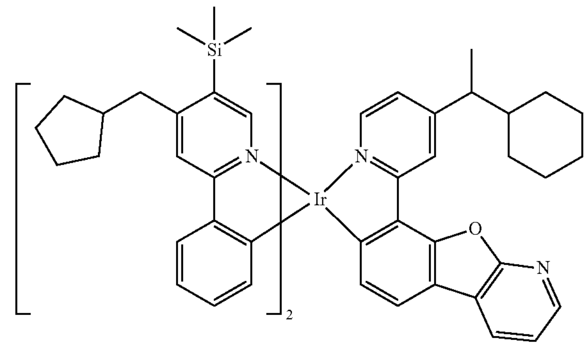
91
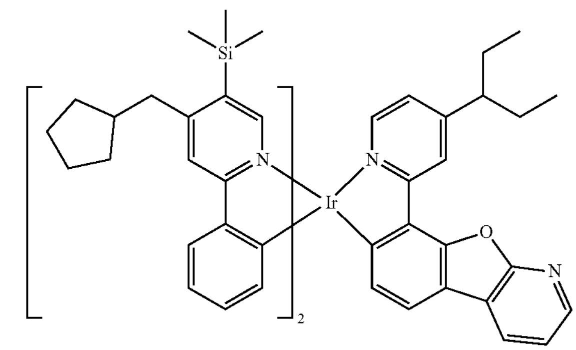

-continued
92
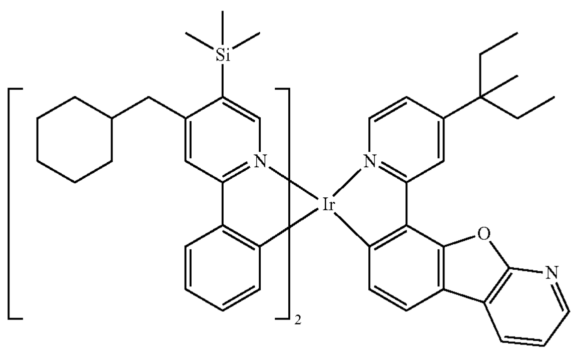
93
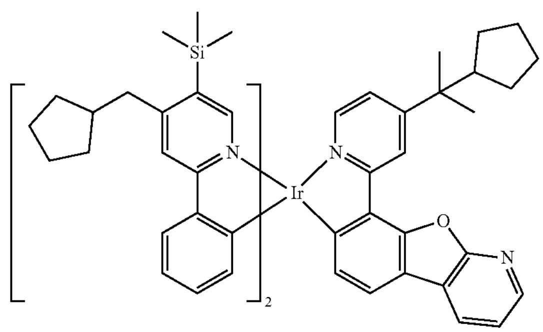
94
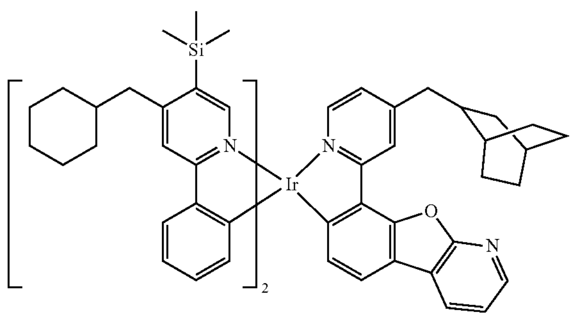
95
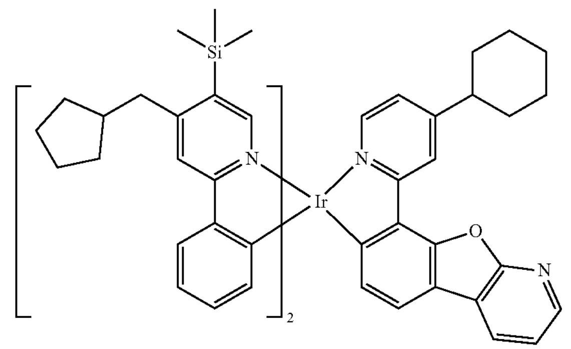
-continued
96
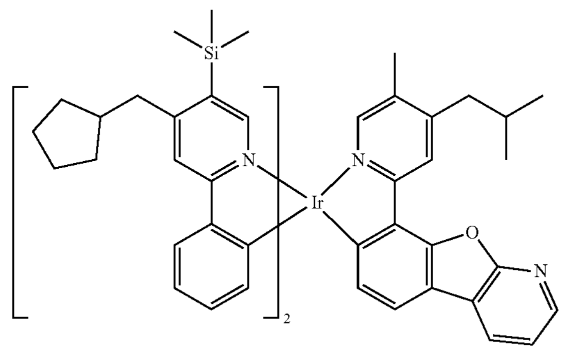
97
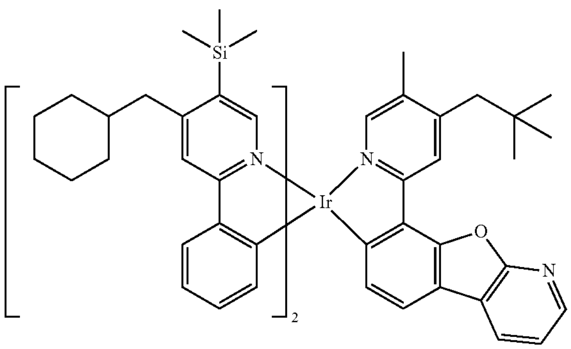
98
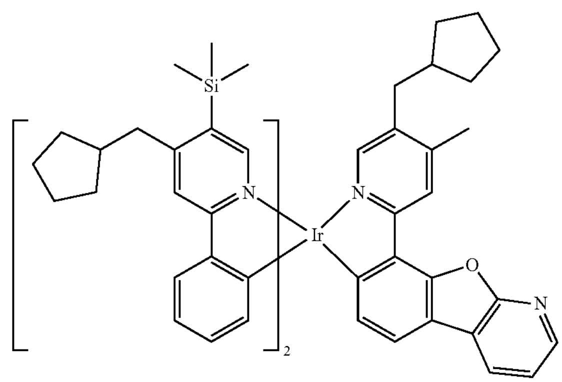
99
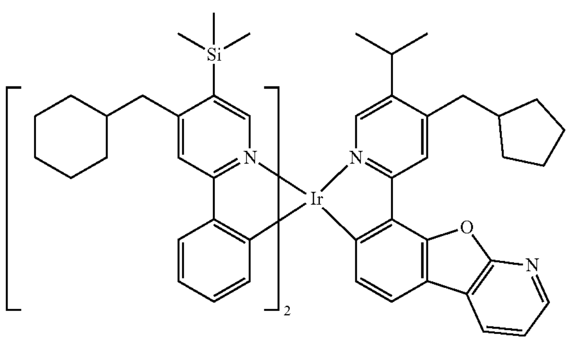

-continued
100
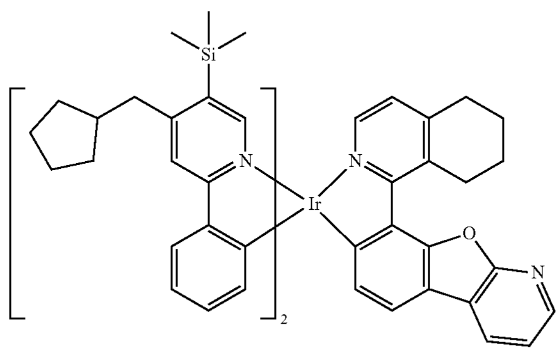
101
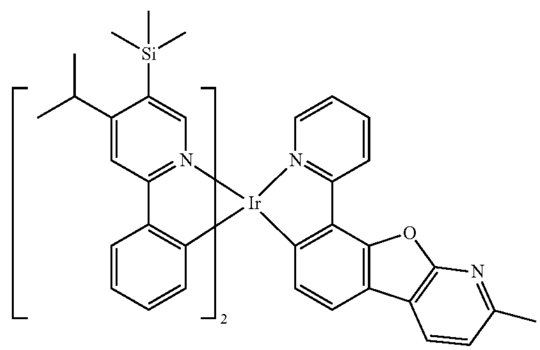
102
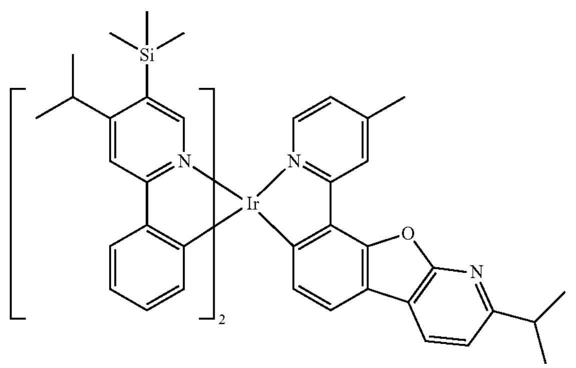
103
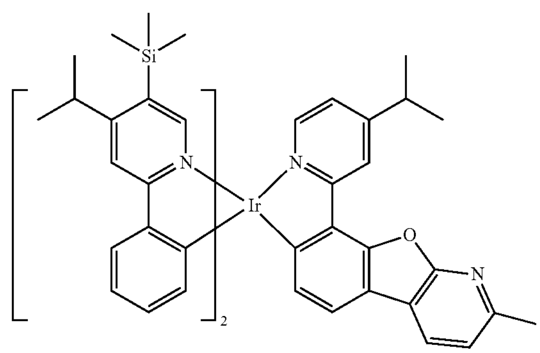
-continued
104
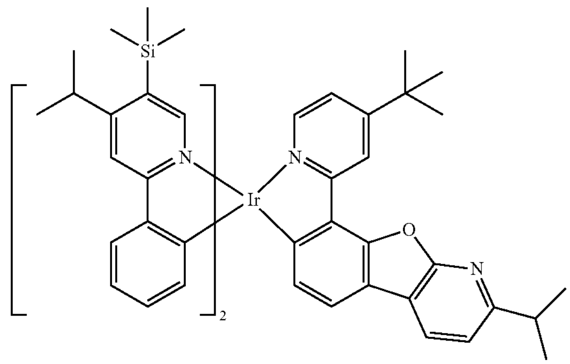
105
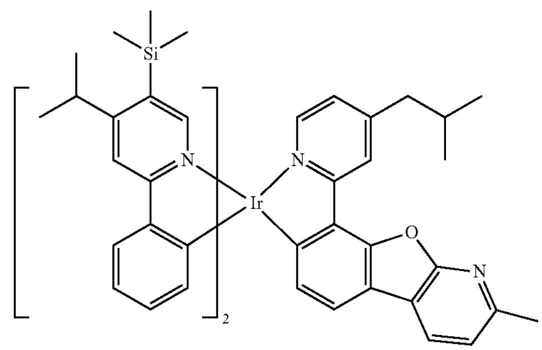
106
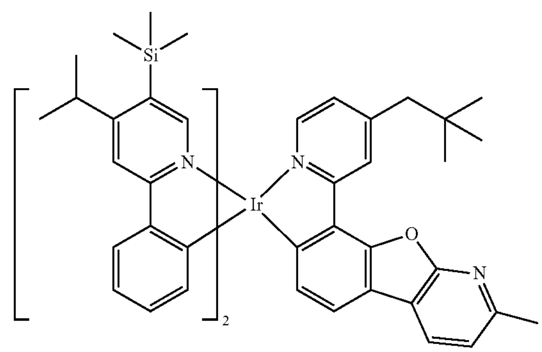
107
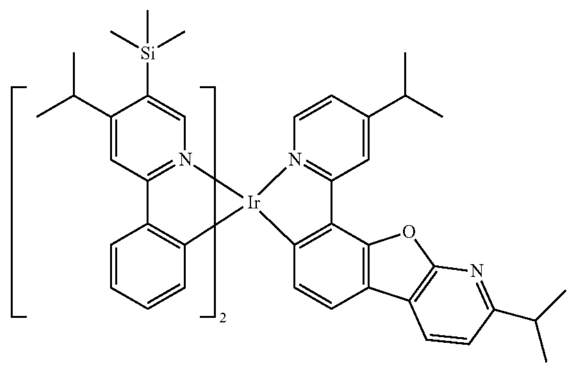

108
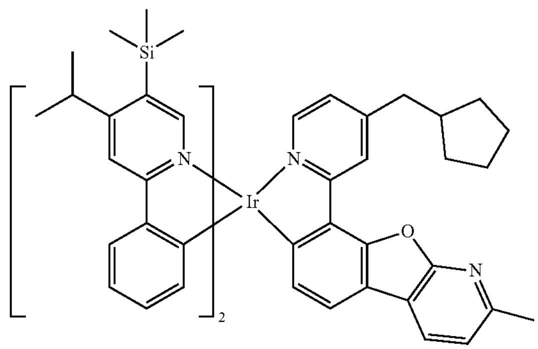
109
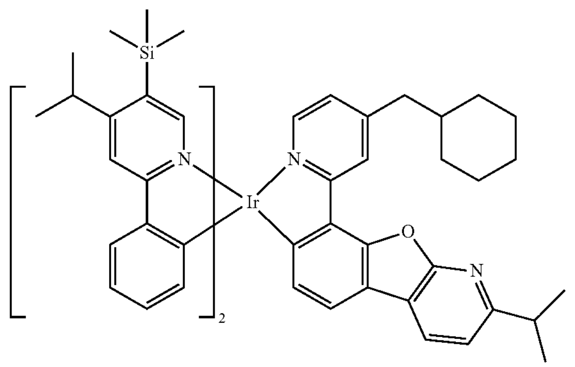
110
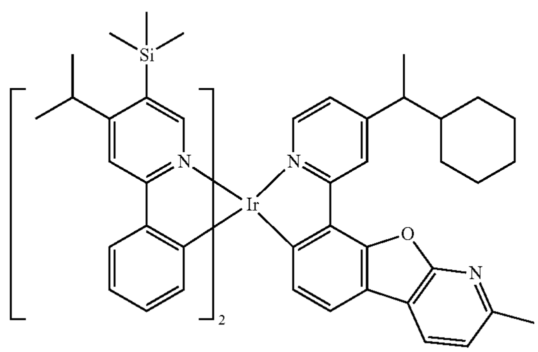
111
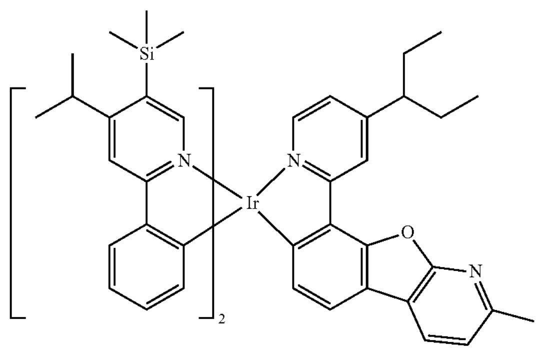
112
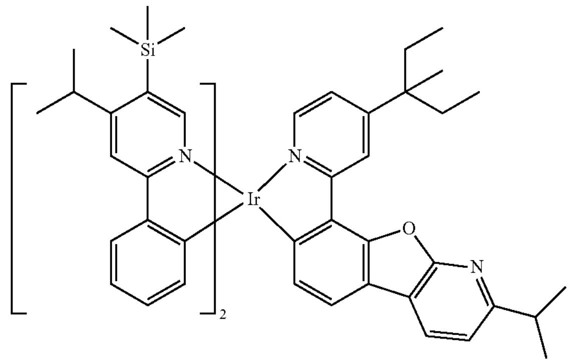
113
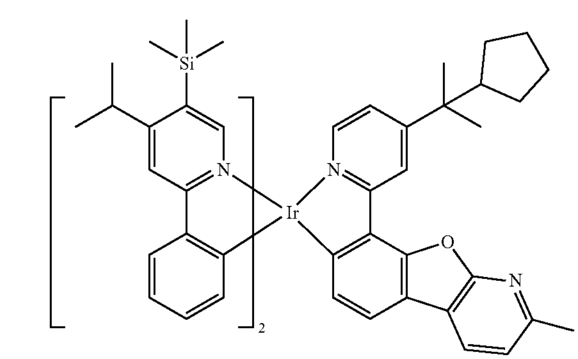
114
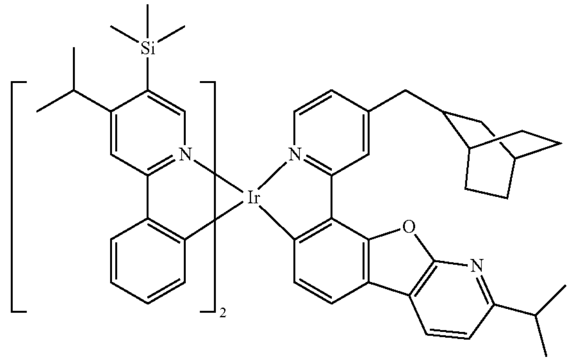
115
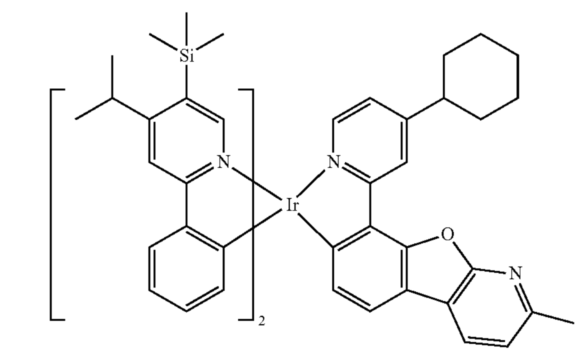

-continued
116
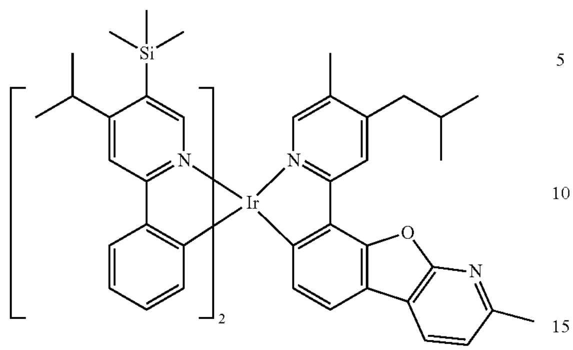
117
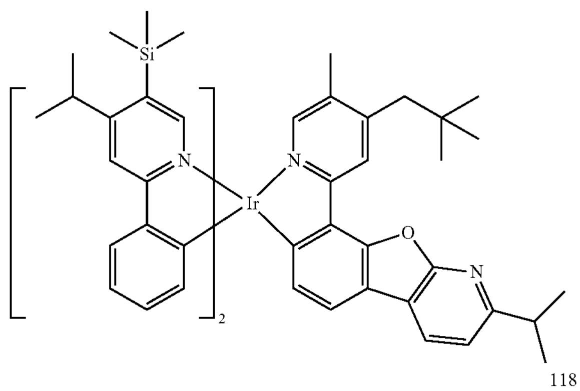
118
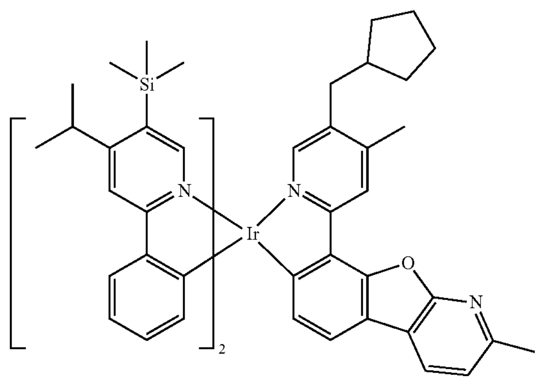
119
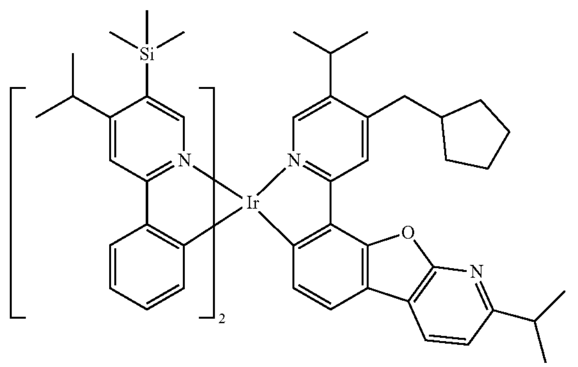
-continued
120
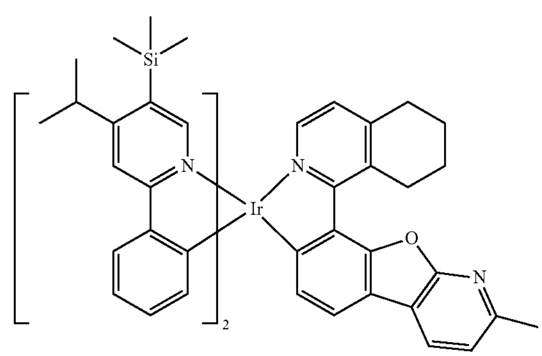
121
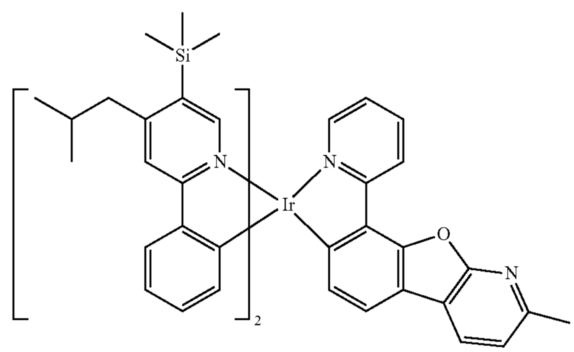
122
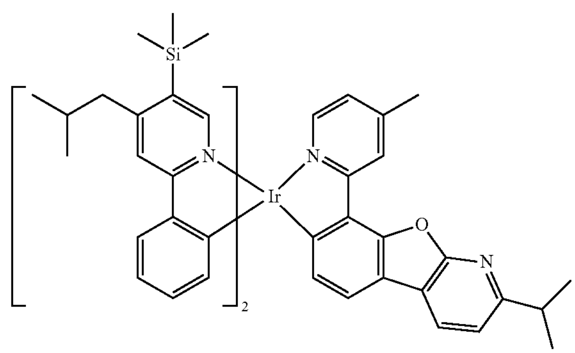
123
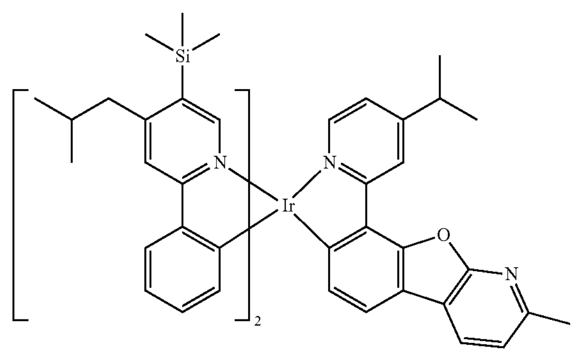

-continued
124
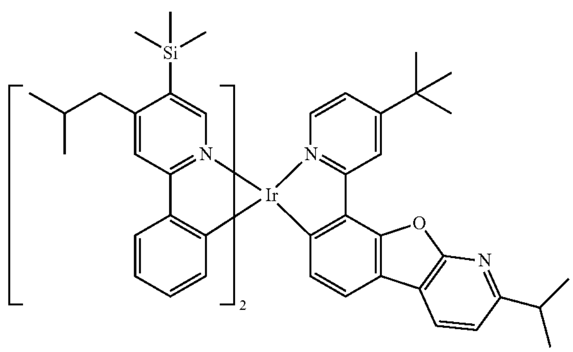
125
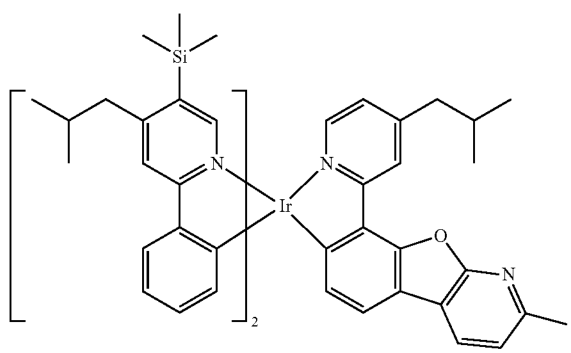
126
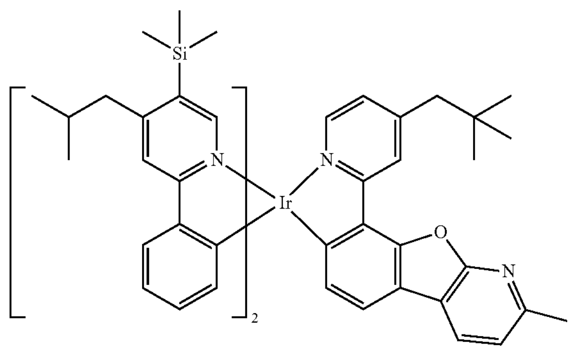
127
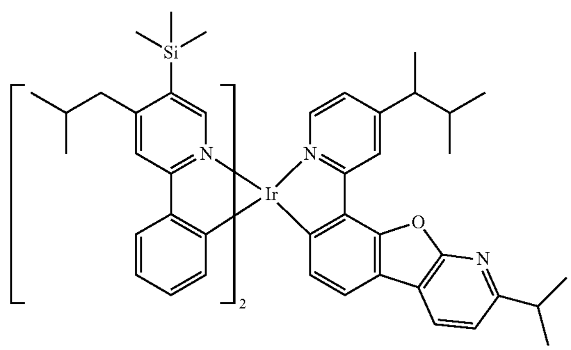
-continued
128
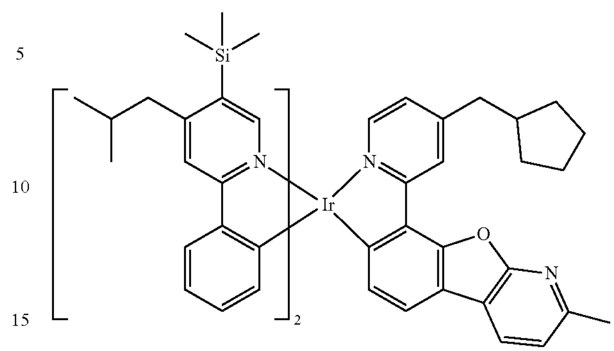
129
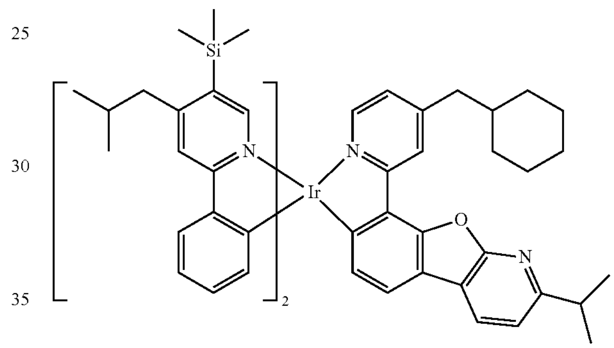
130
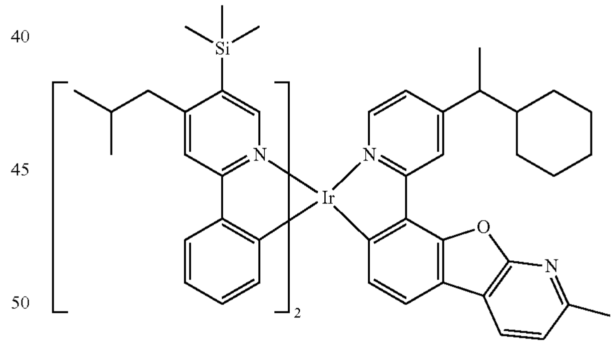
131
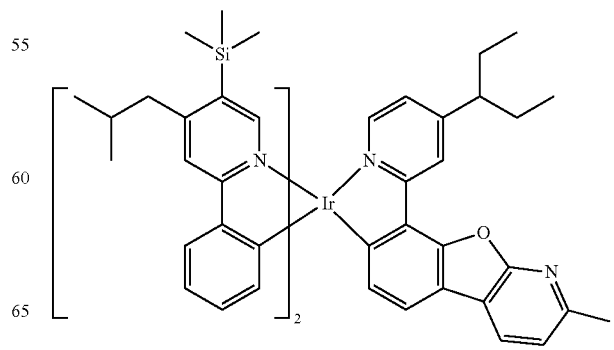

-continued
132
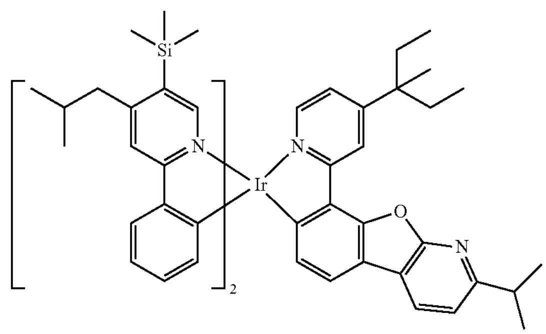
133
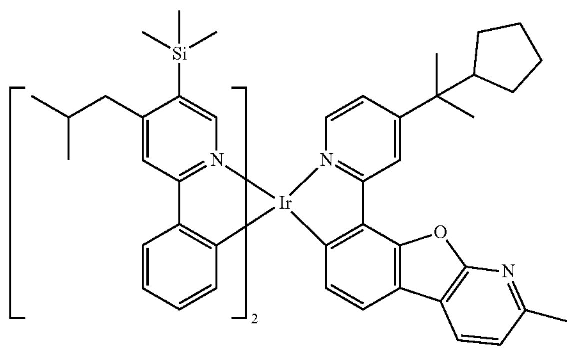
134
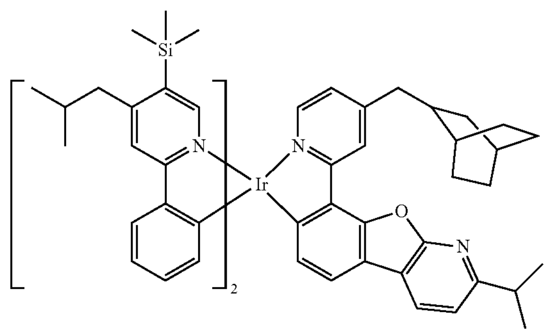
135
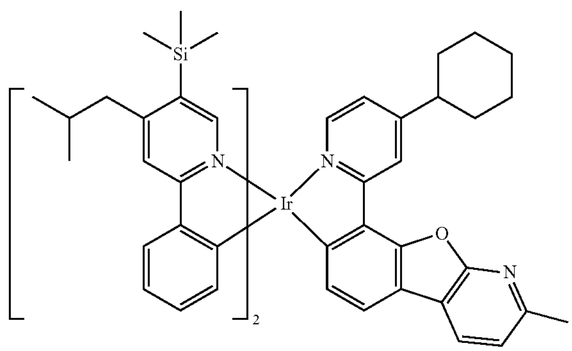
-continued
136
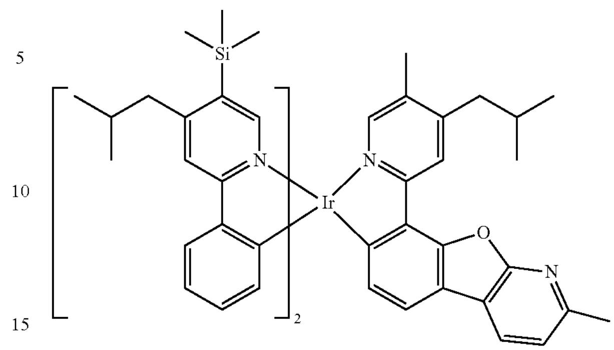
137
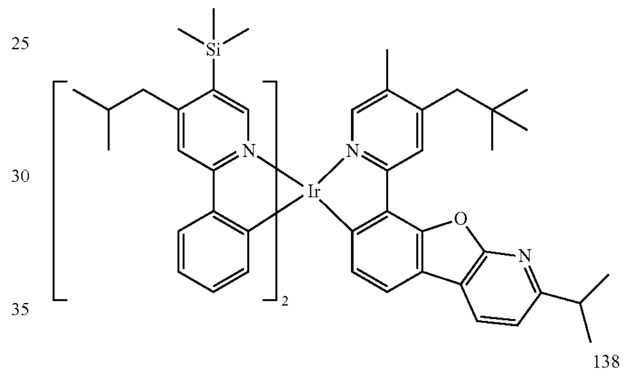
138
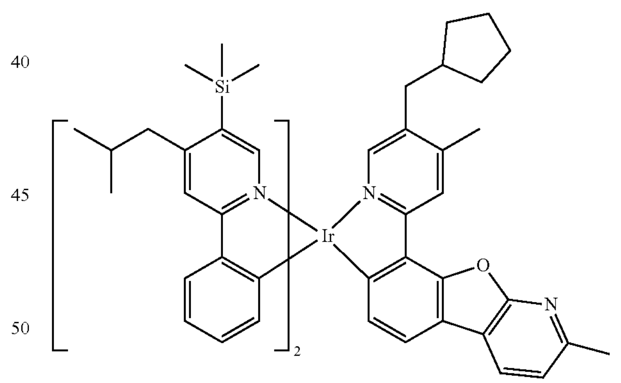
139
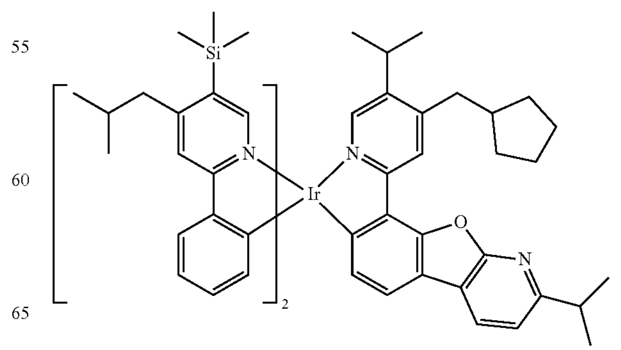

-continued
140
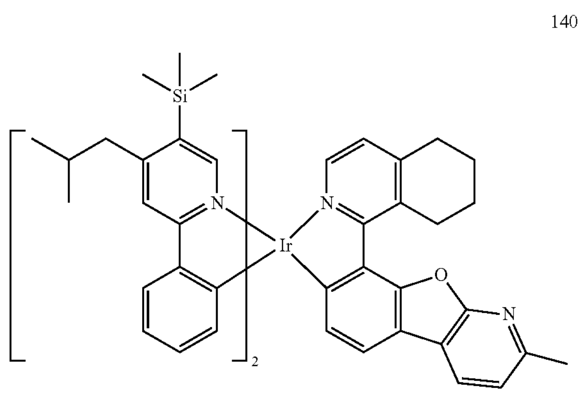
141
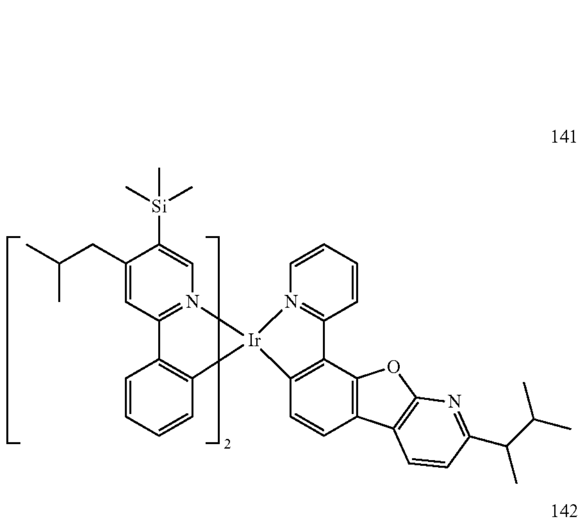
142
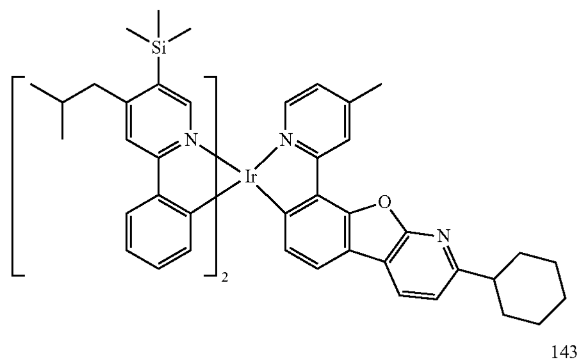
143
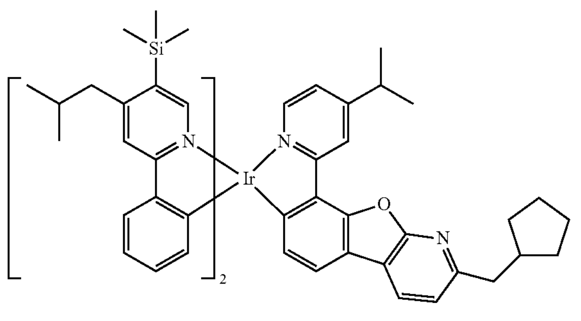
-continued
144
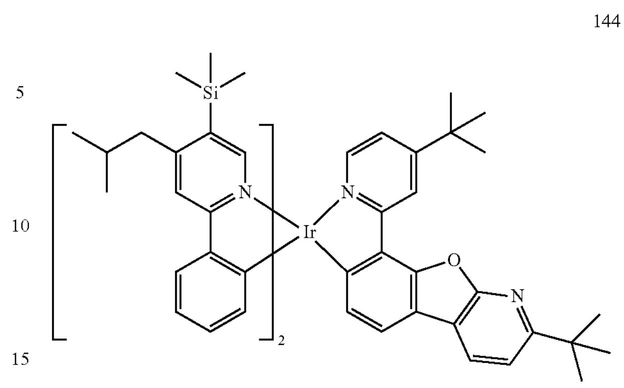
145
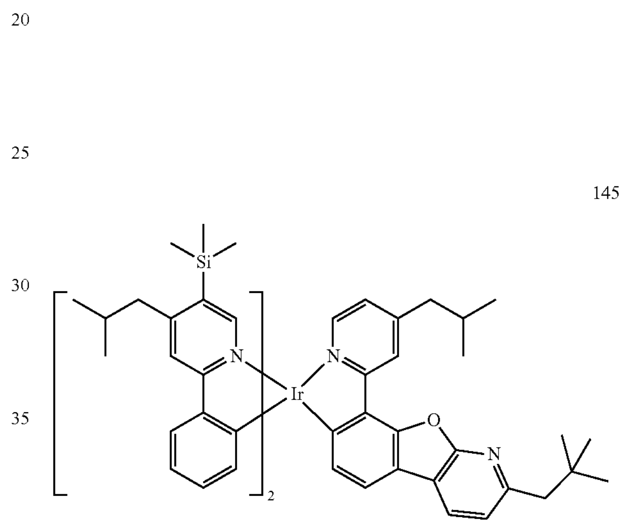
146
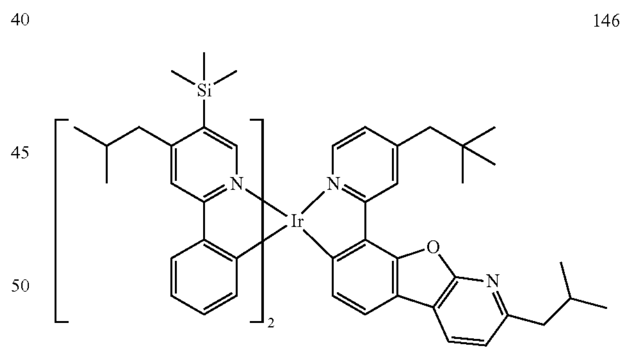
147
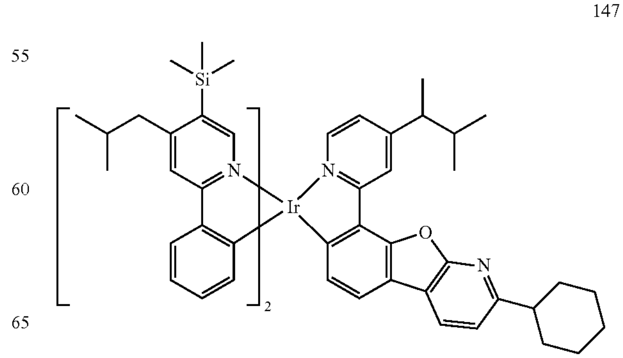

-continued
148
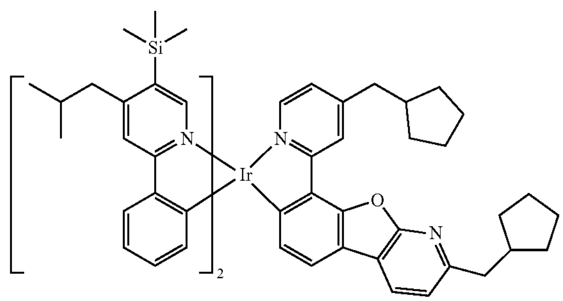
149
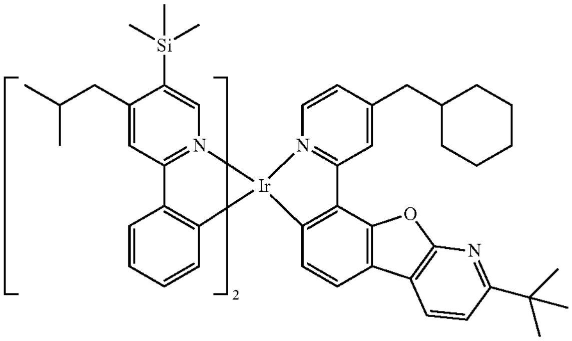
150
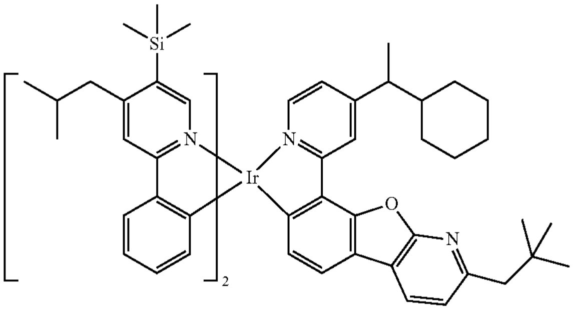
151
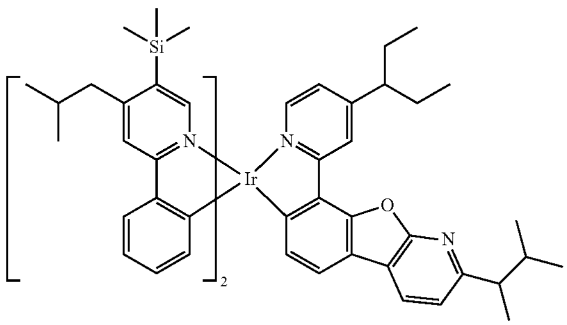
-continued
152
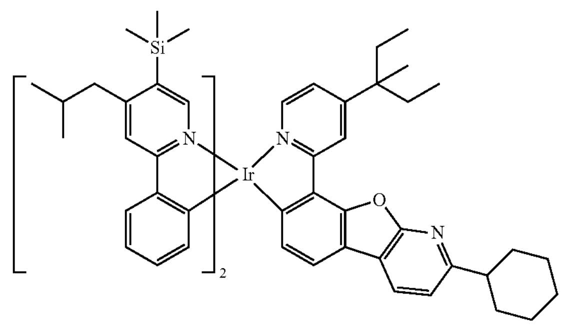
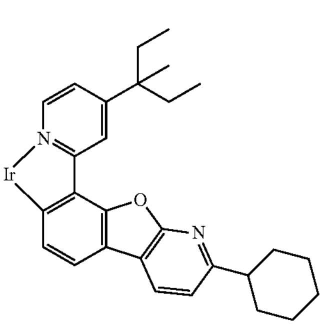
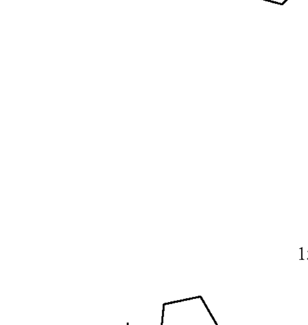
153
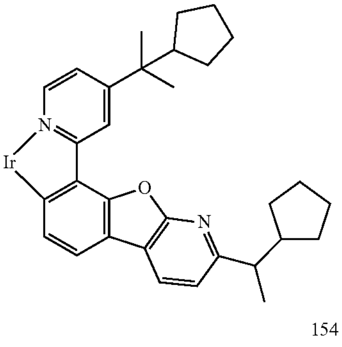
154
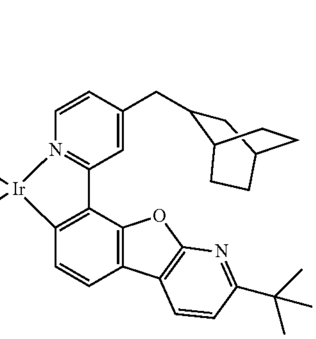
155
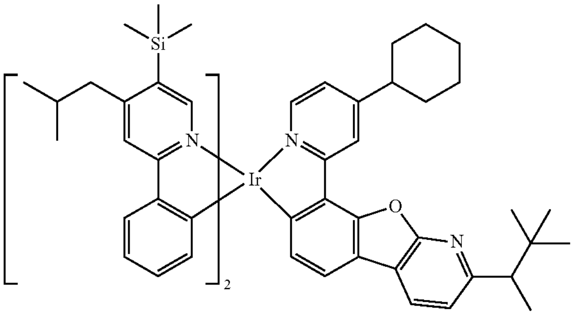

-continued
156
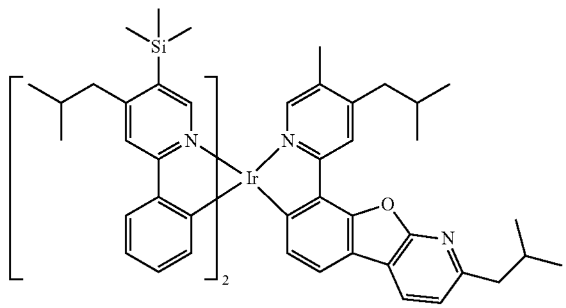
157
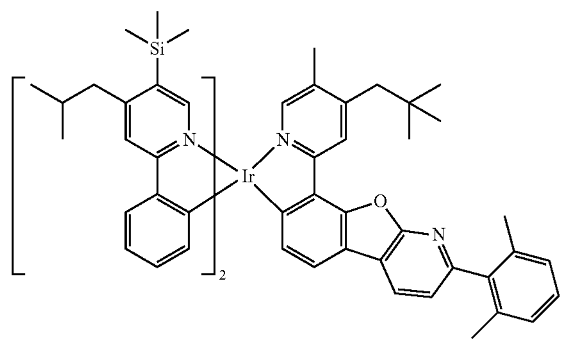
158
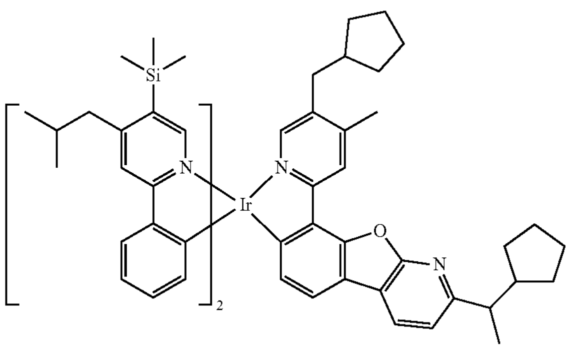
159
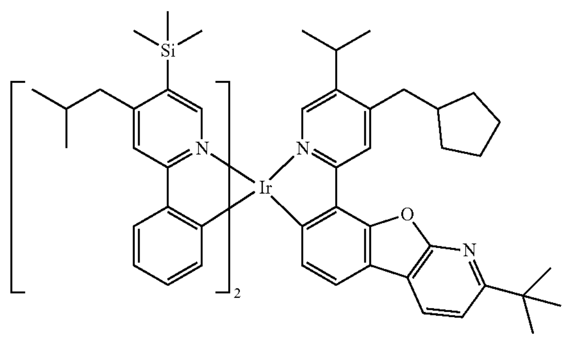
-continued
160
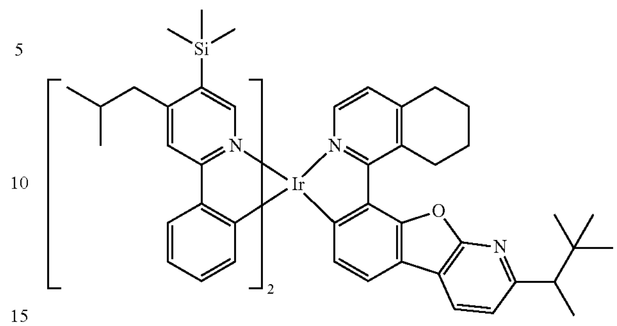
161
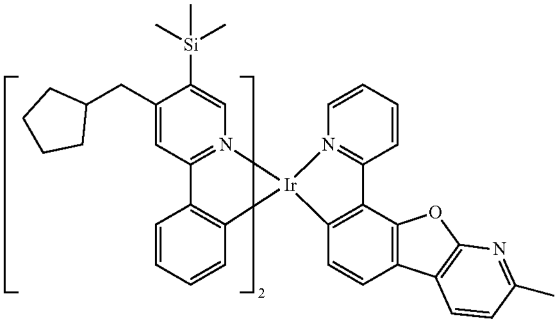
162
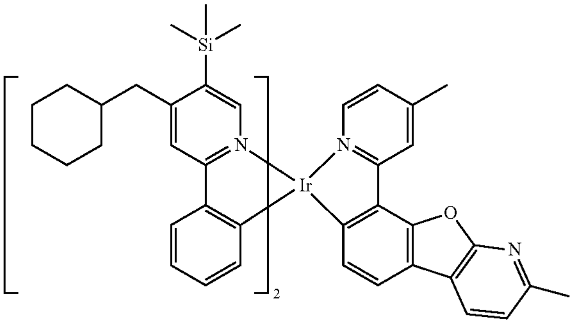
163
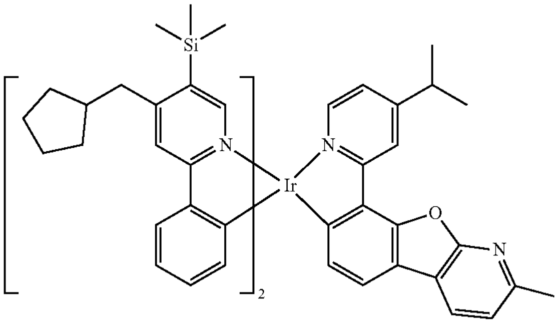

-continued
164
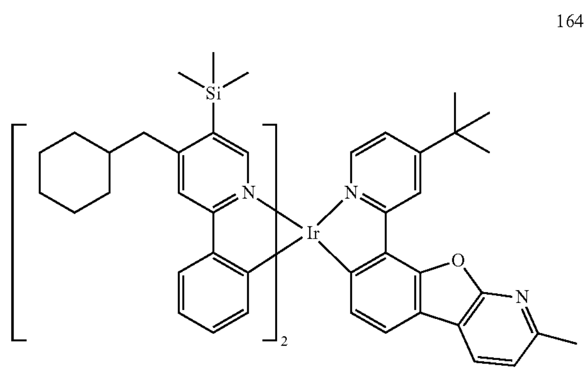
165
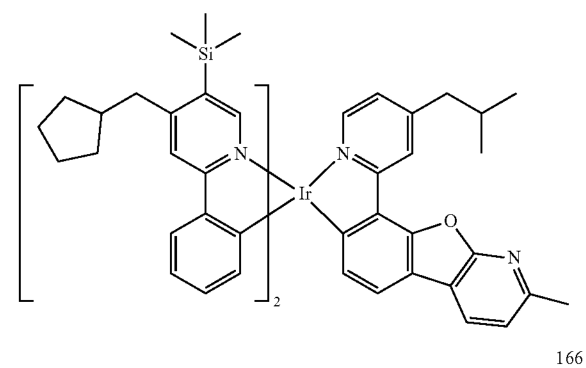
166
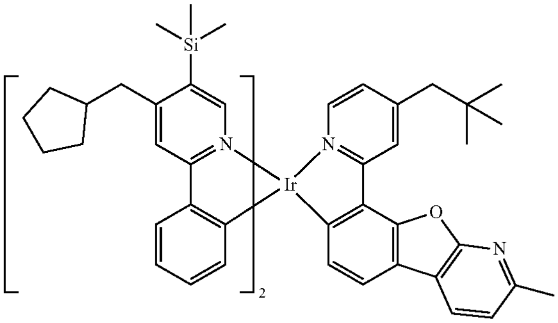
167
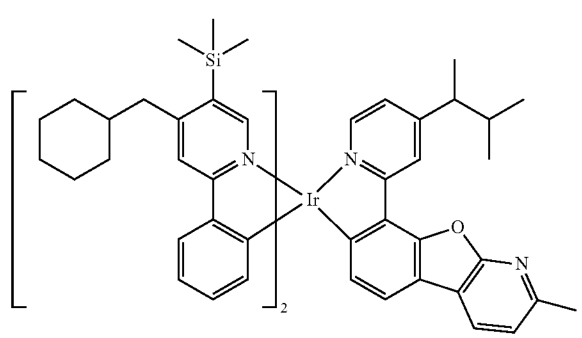
-continued
168
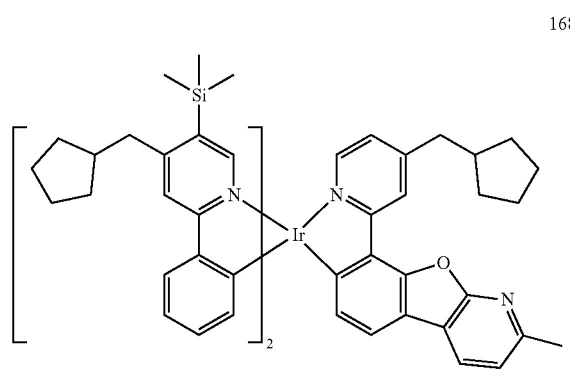
169
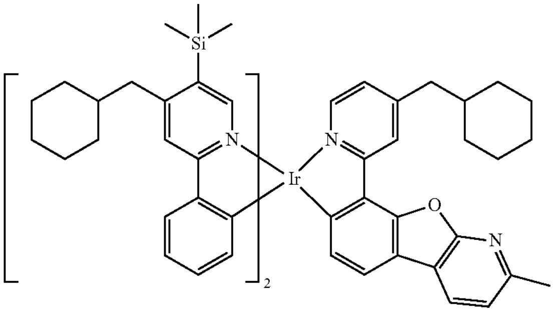
170
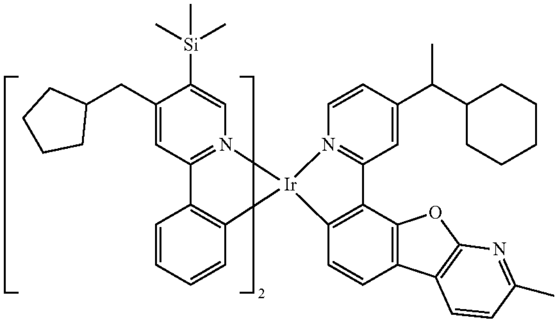
171
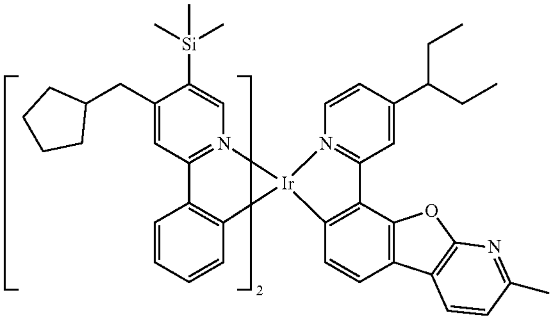

-continued
172
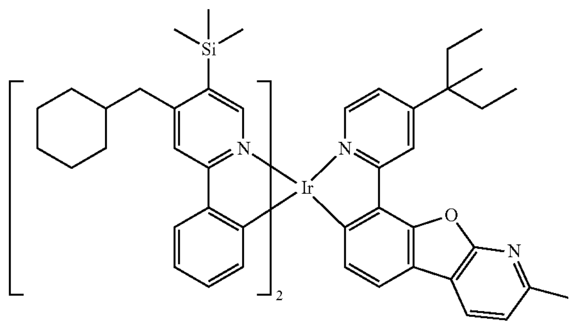
173
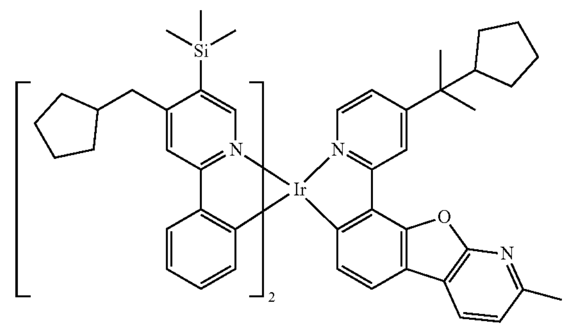
174
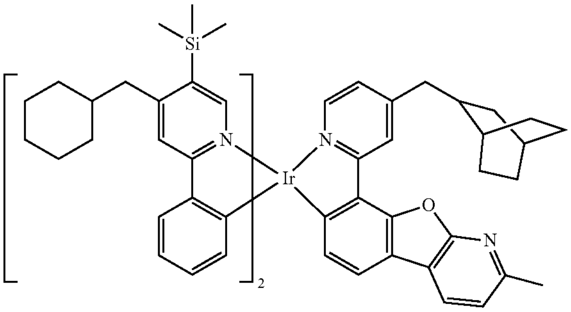
175
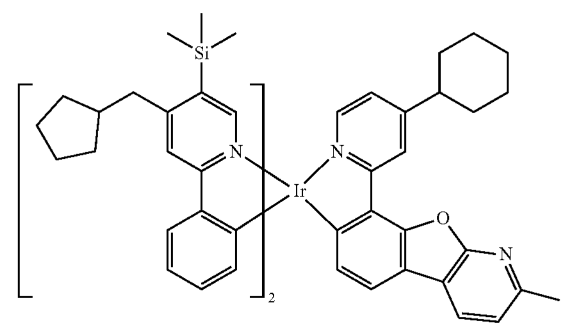
-continued
176
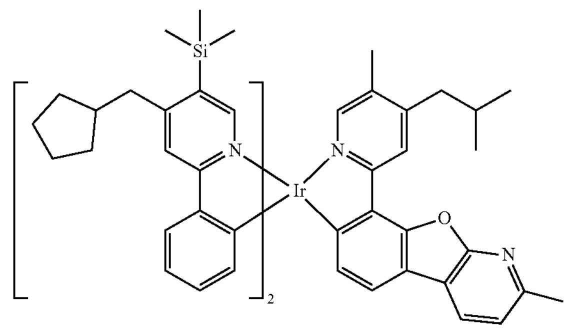
177
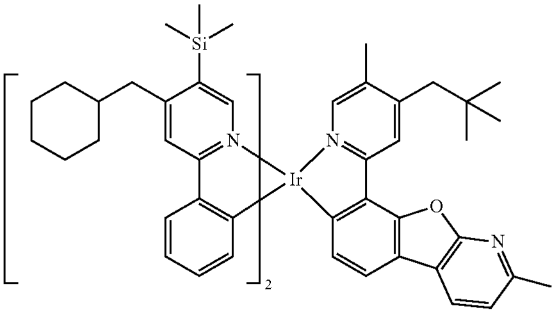
178
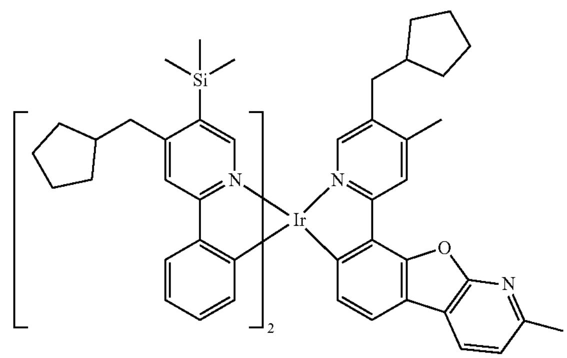
179
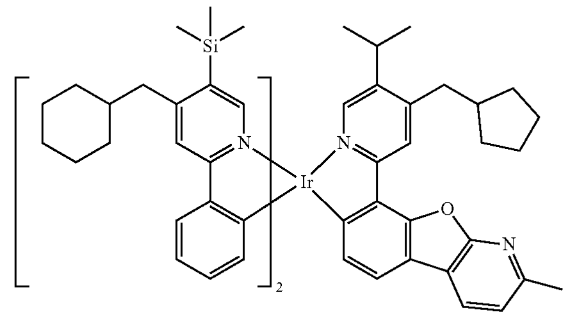

180
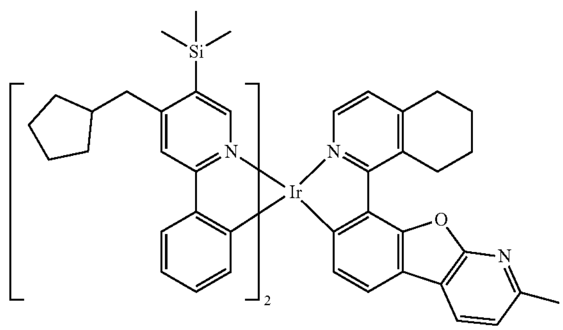
181
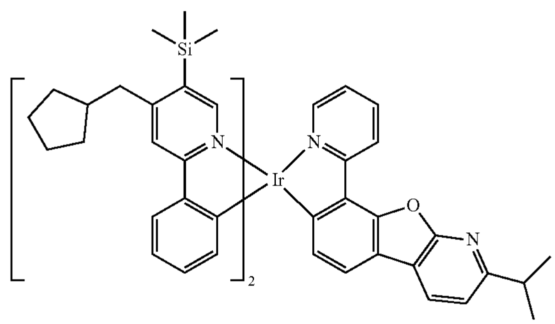
182
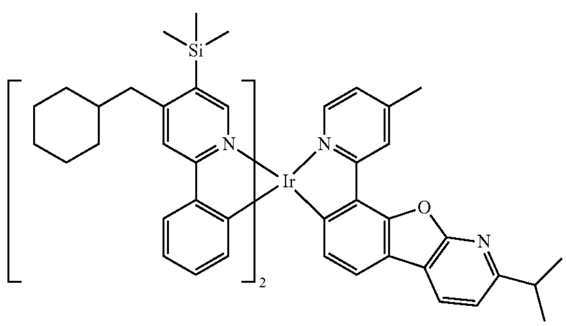
183
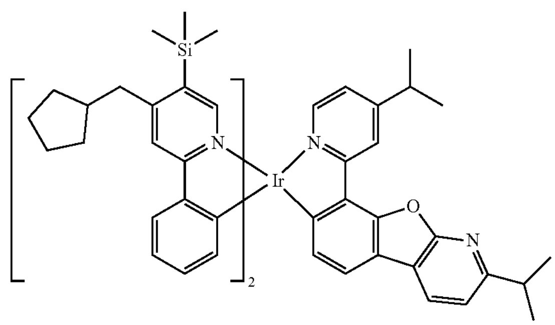
184
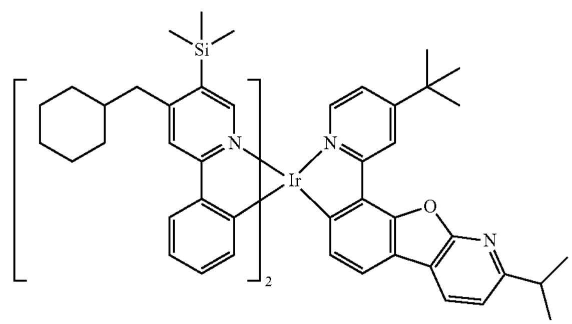
185
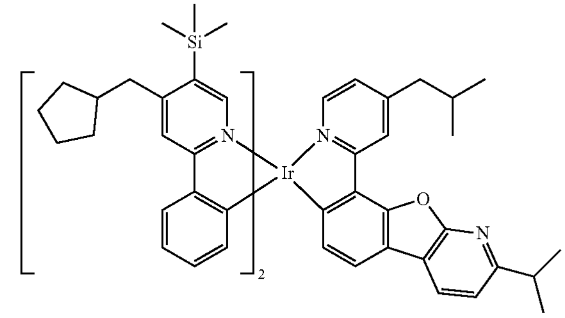
186
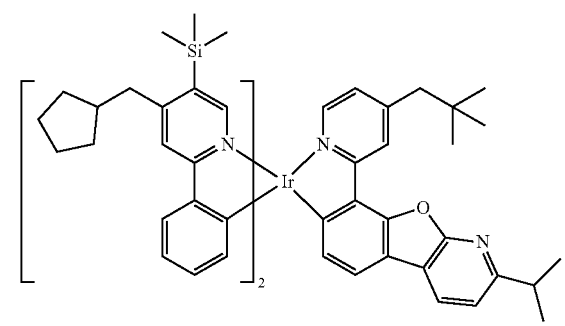
187
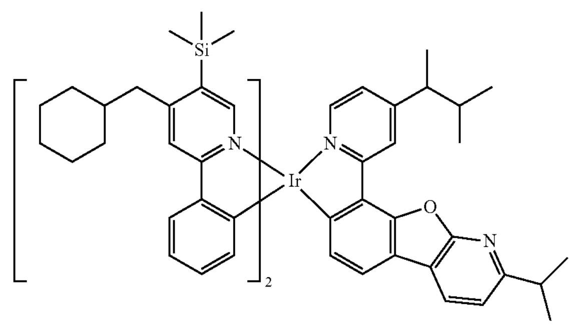

-continued
188
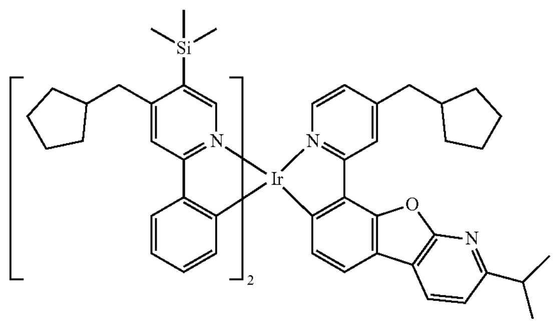
189
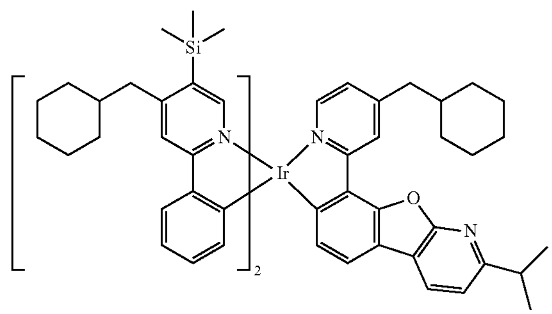
190
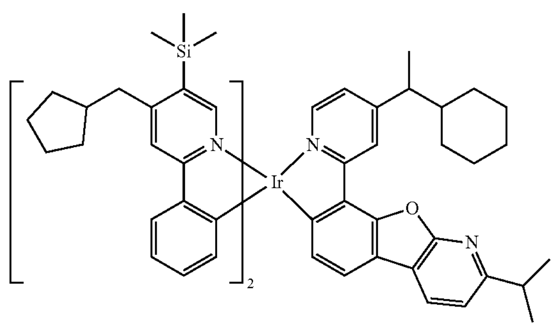
191
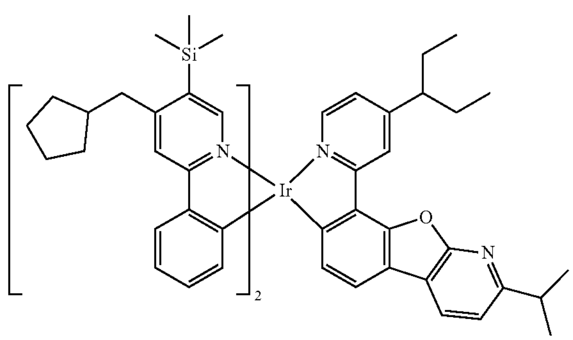
-continued
192
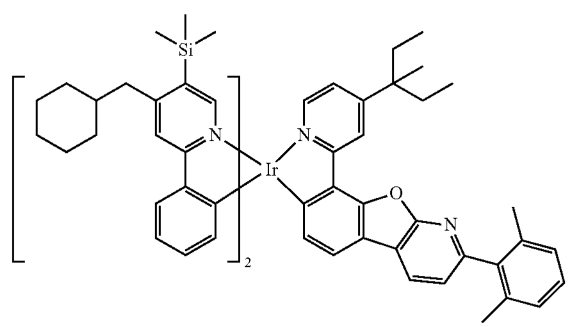
193
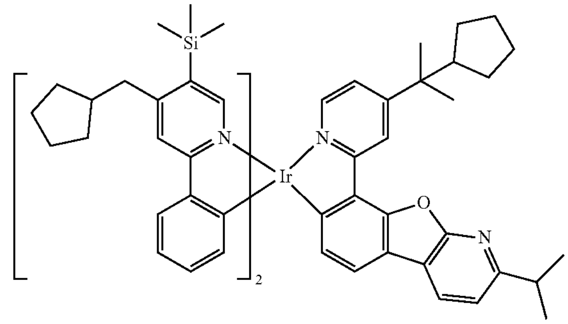
194
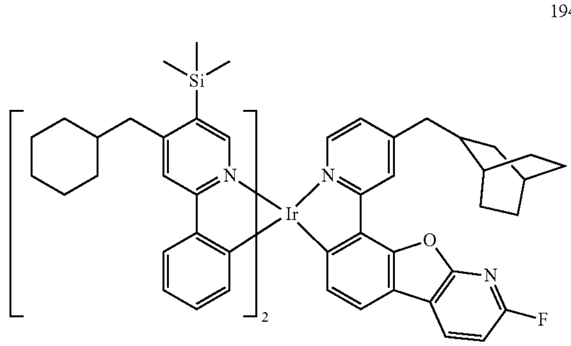
195
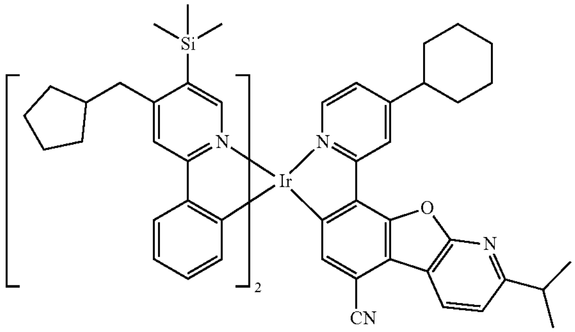

-continued
196
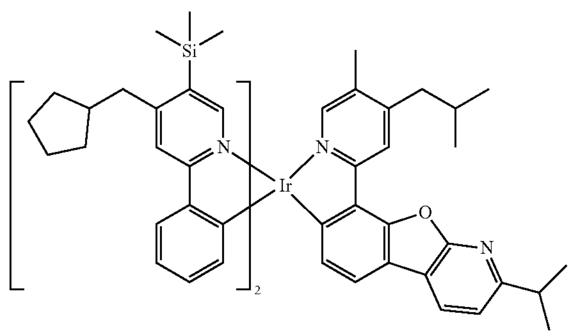
197
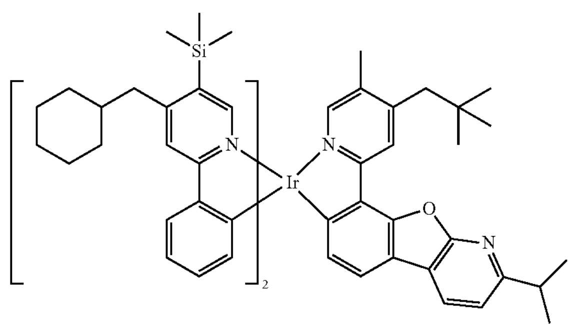
198
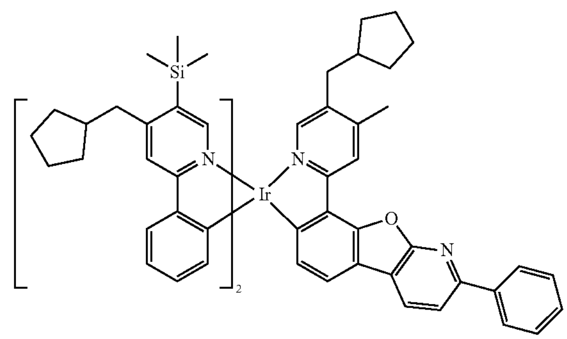
199
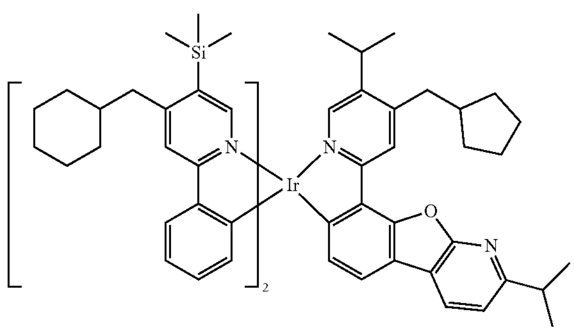
-continued
200
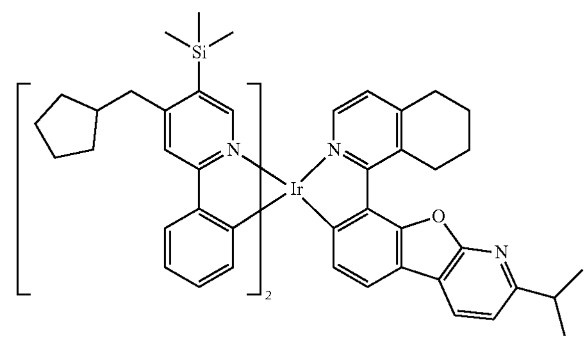
201
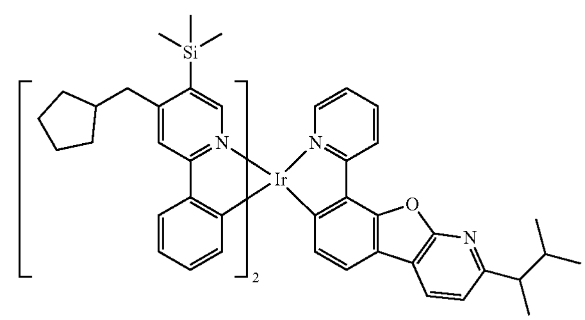
202
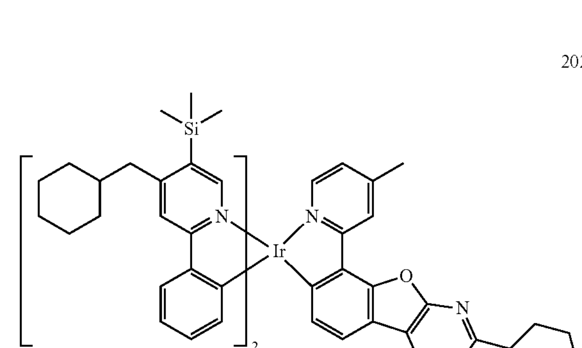
203
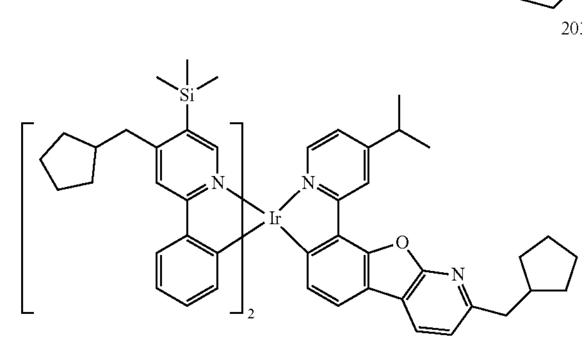

-continued
204
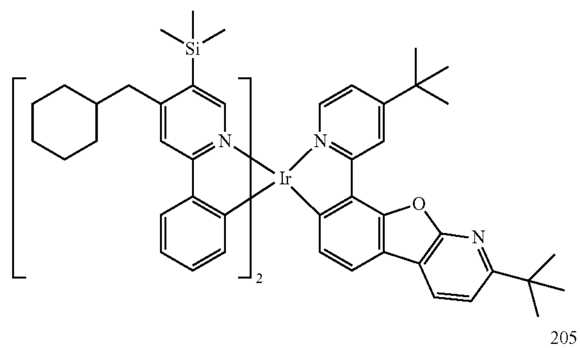
205
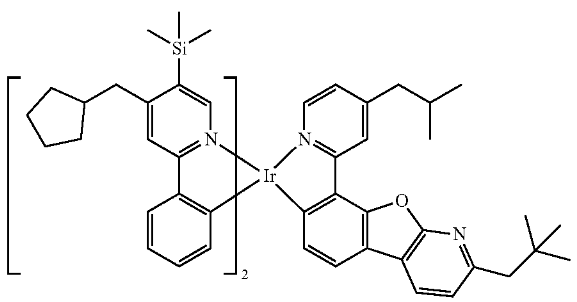
206
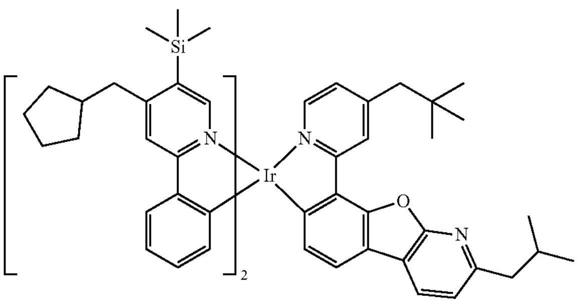
207
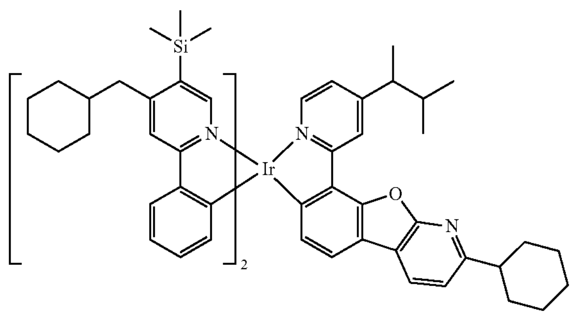
208
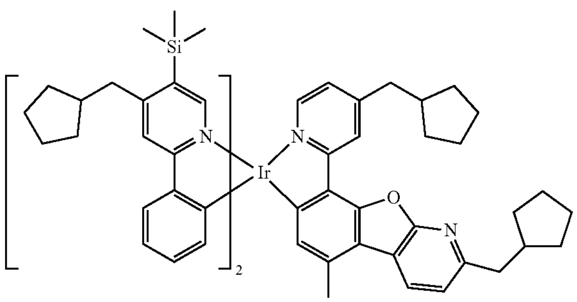
-continued
209
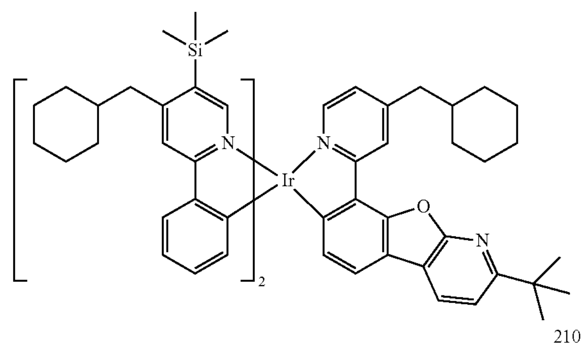
210
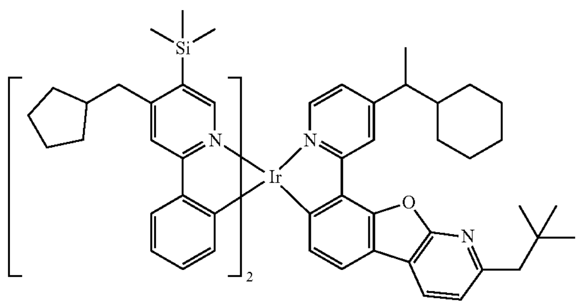
211
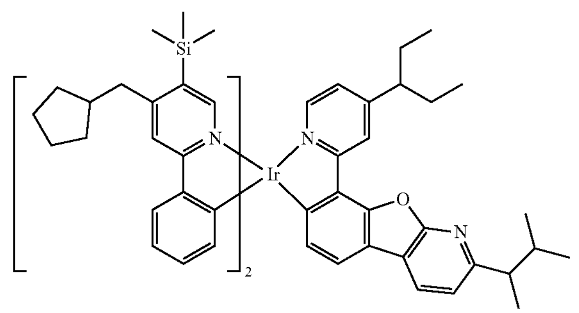
212
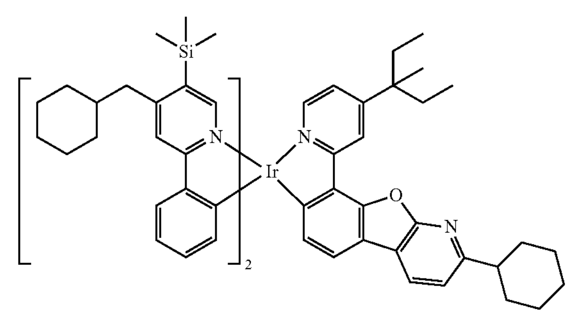
213
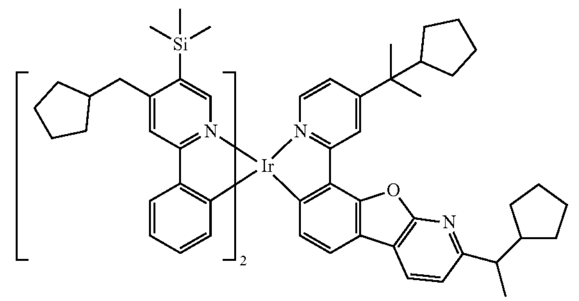

-continued
214
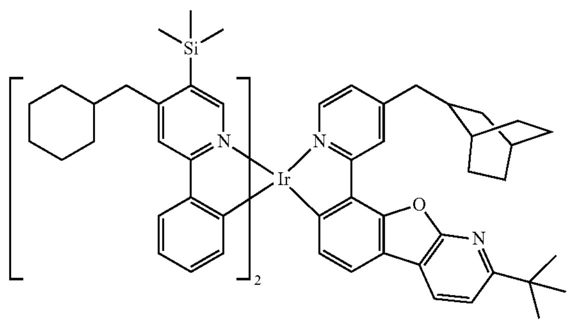
215
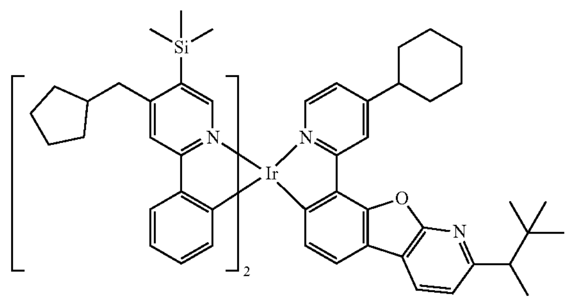
216
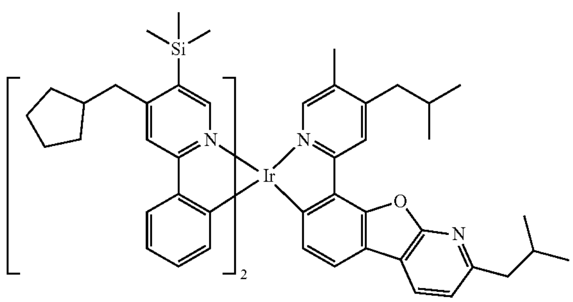
217
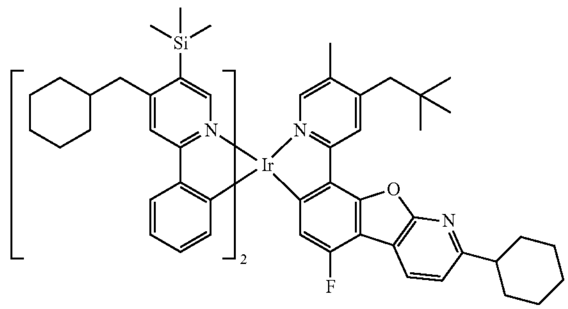
-continued
218
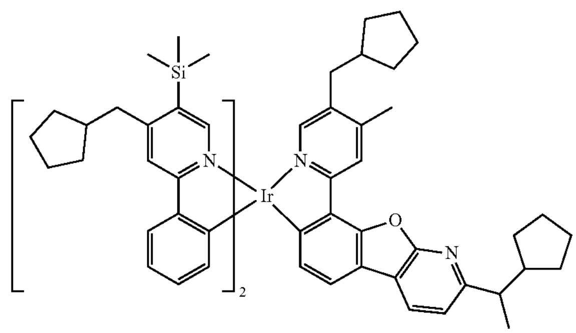
219
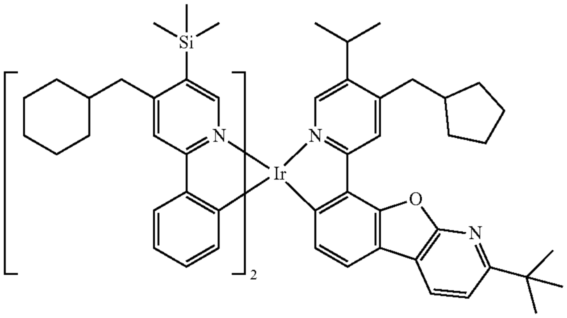
220
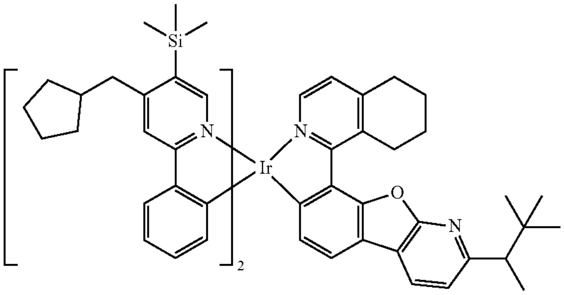
221
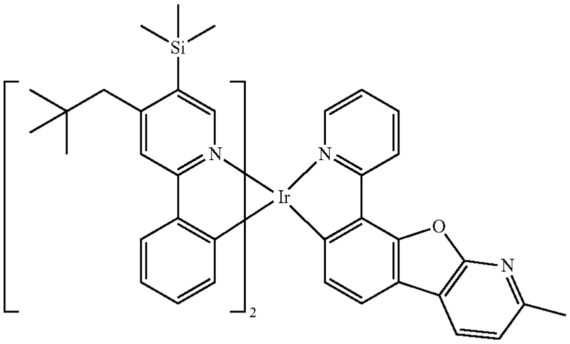

-continued
222
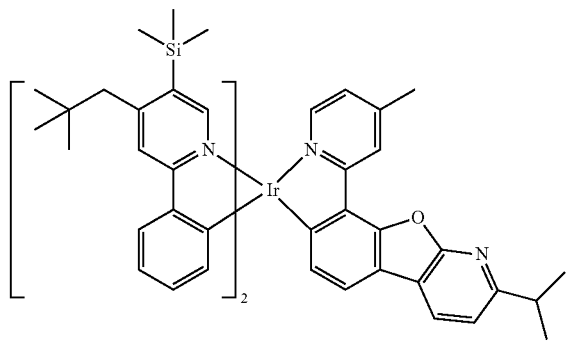
223
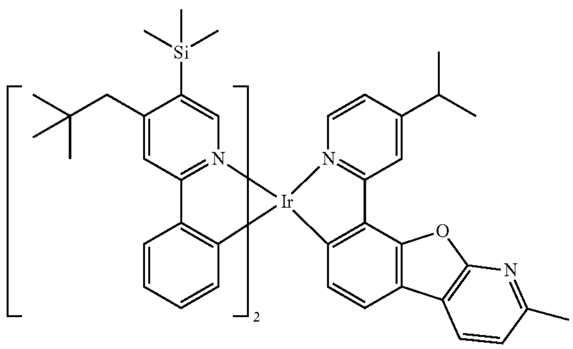
224
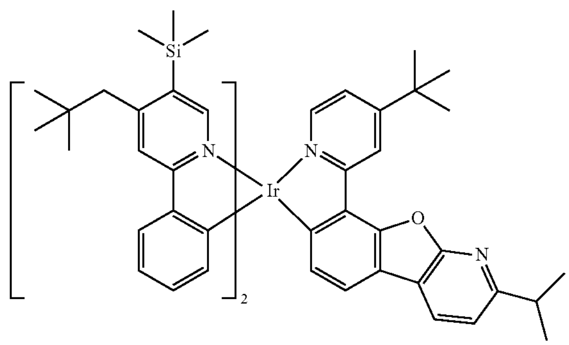
225
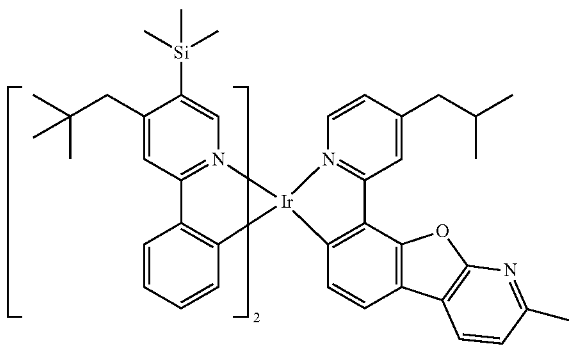
-continued
226
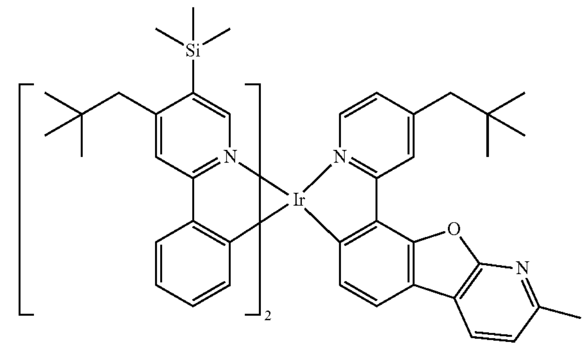
227
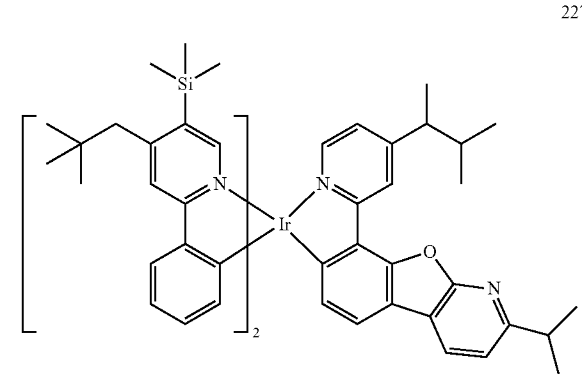
228
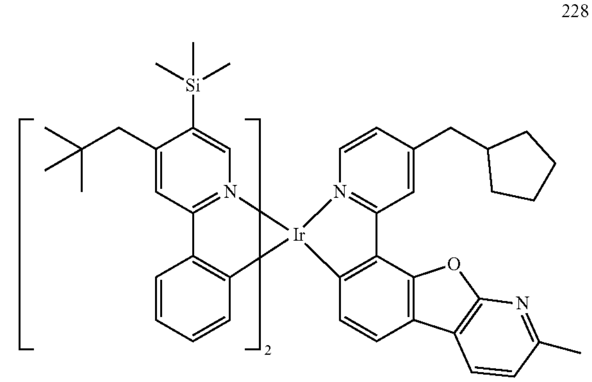
229
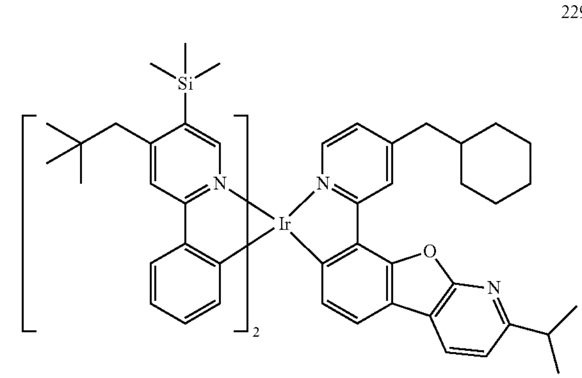

-continued
230
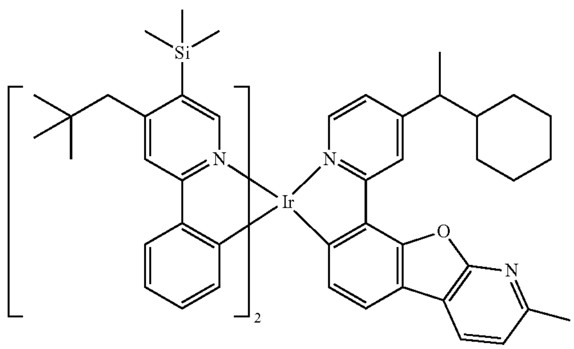
231
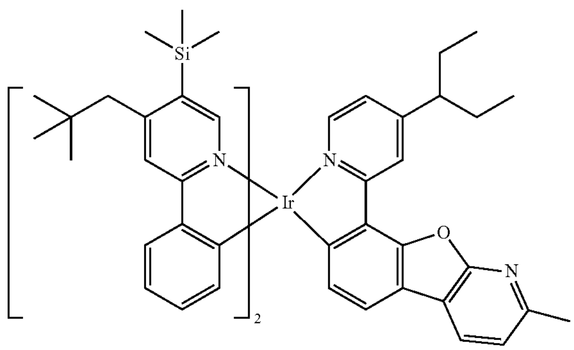
232
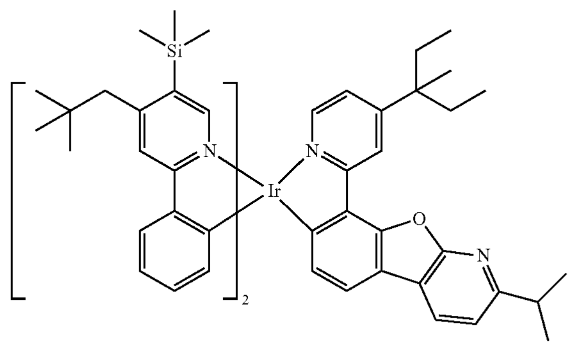
233
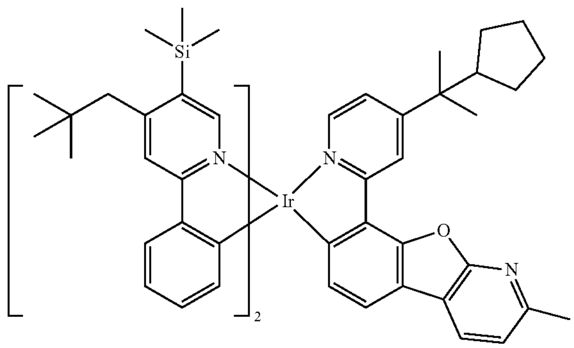
-continued
234
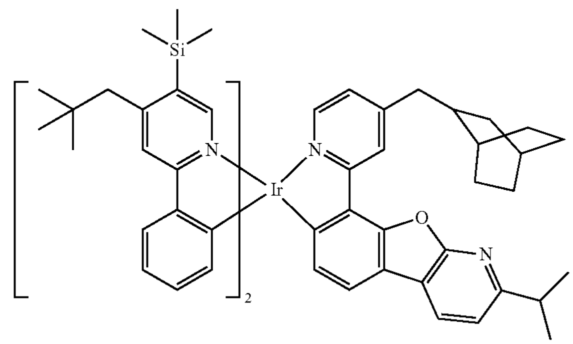
235
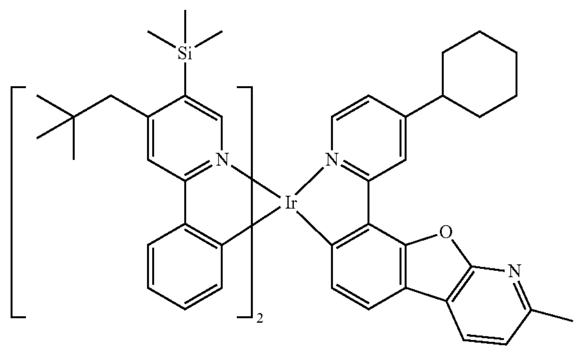
236
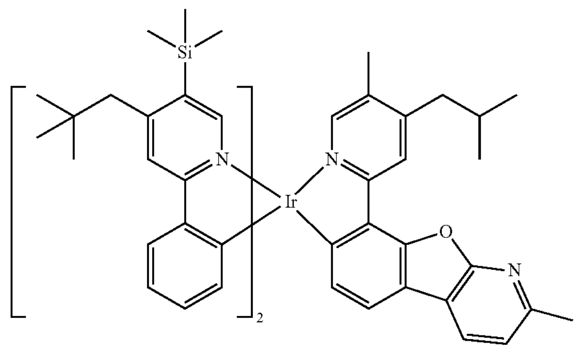
237
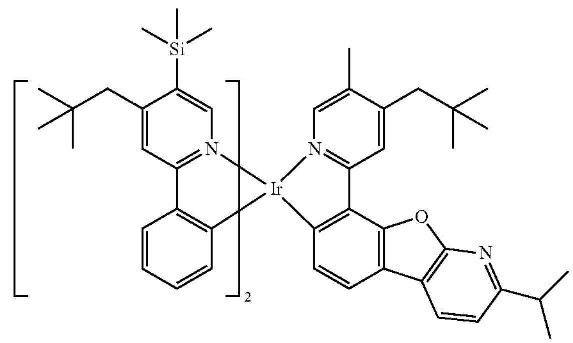

-continued
238
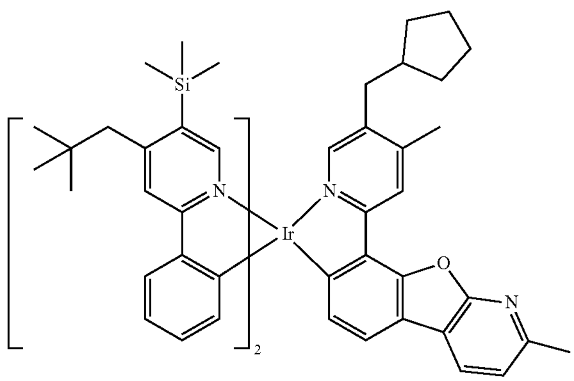
239
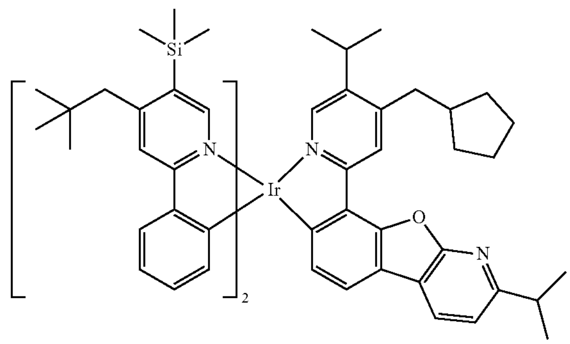
240
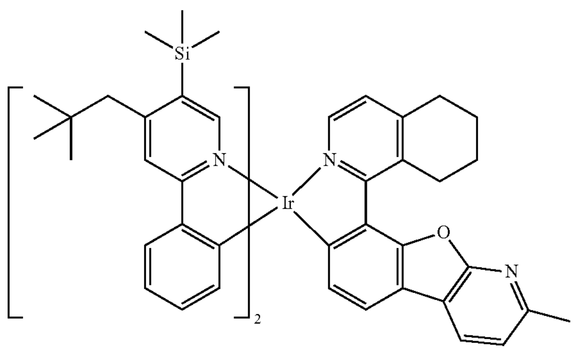
241
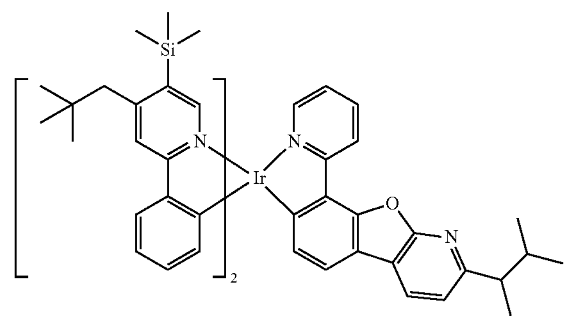
-continued
242
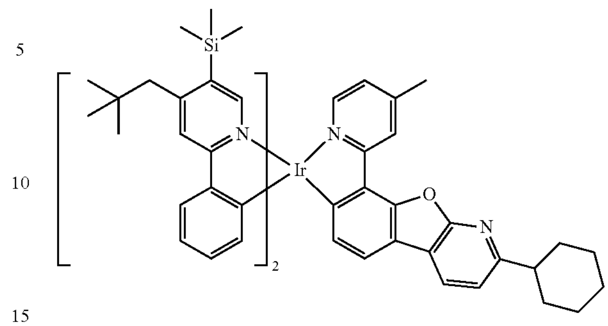
243
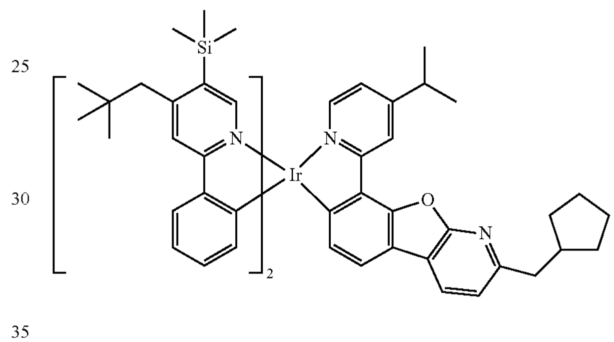
244
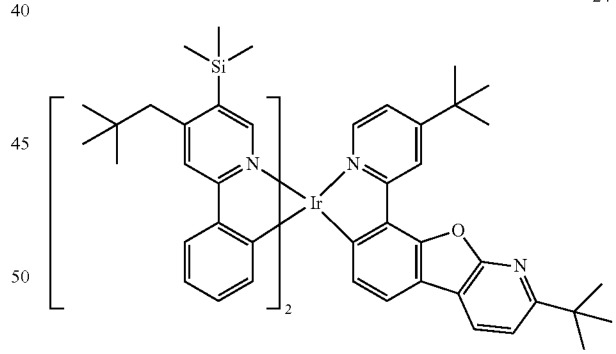
245
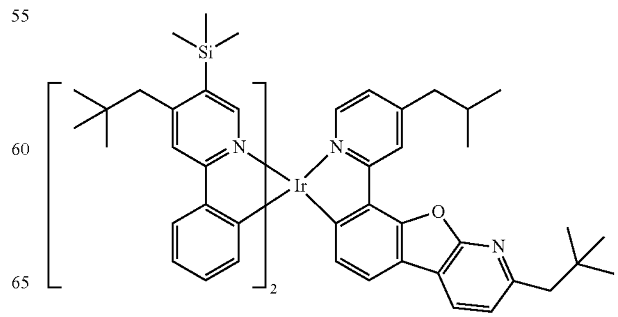

-continued
246
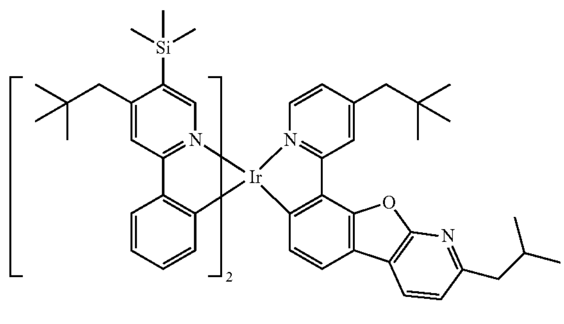
247
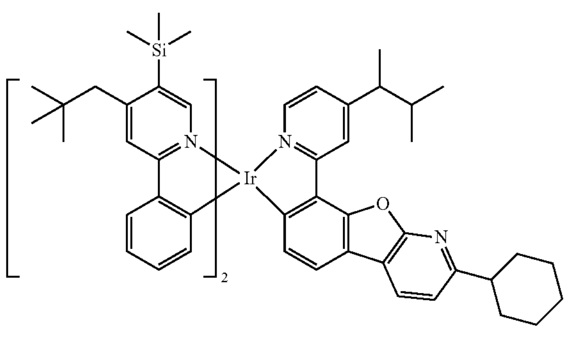
248
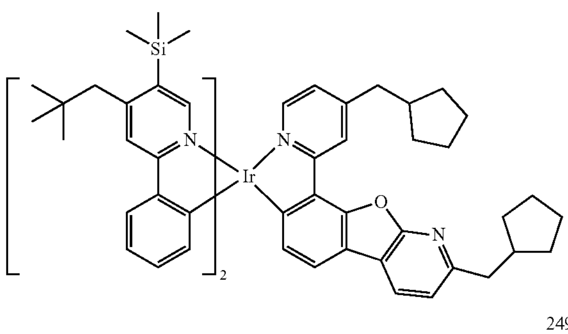
249
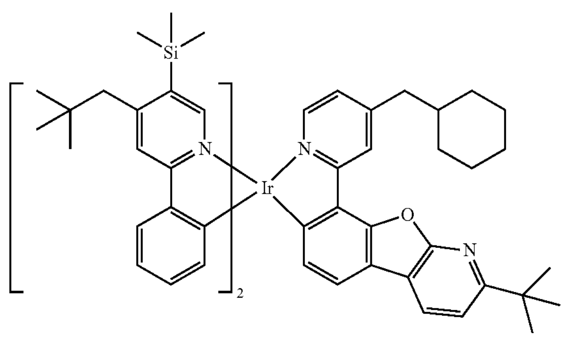
-continued
250
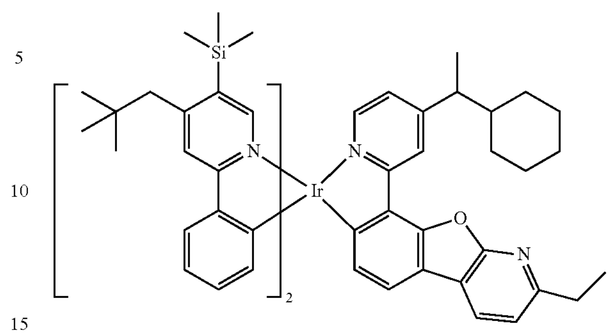
251
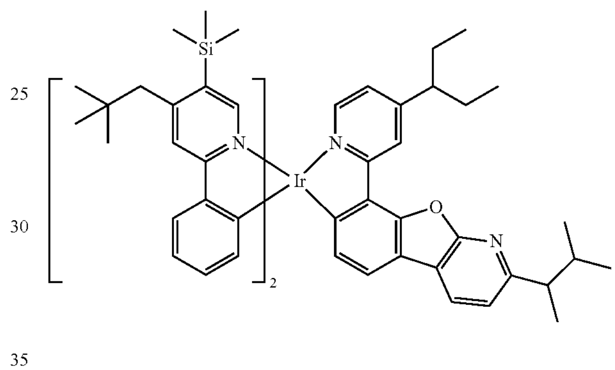
252
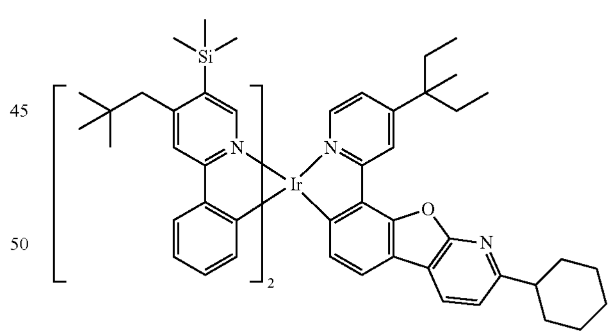
253
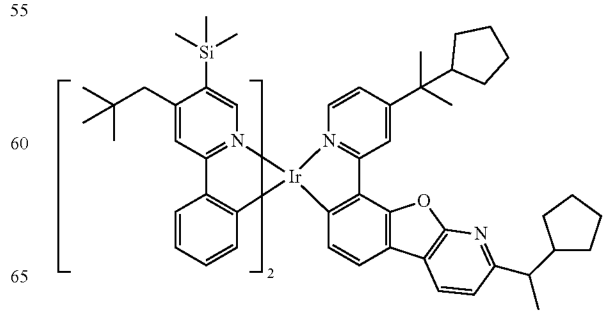

-continued
254
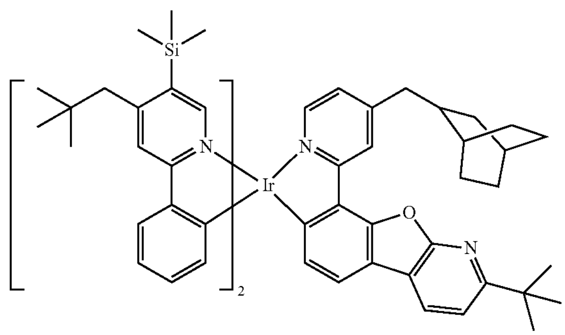
255
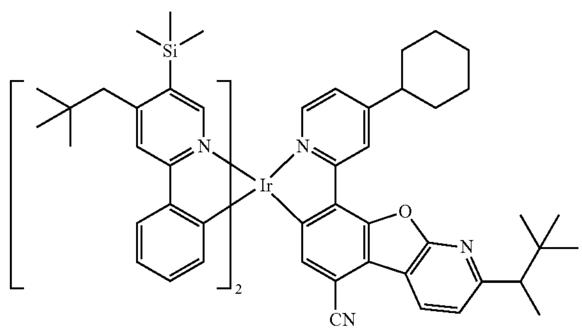
256
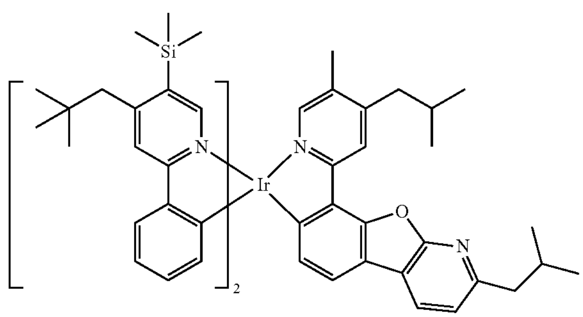
257
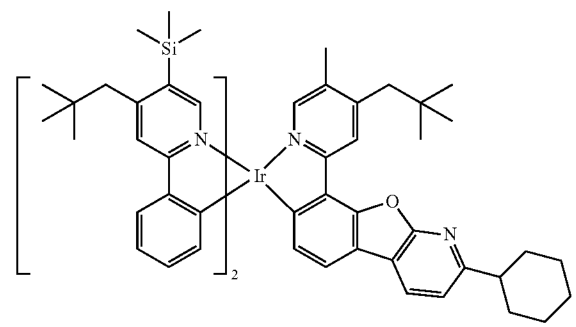
-continued
258
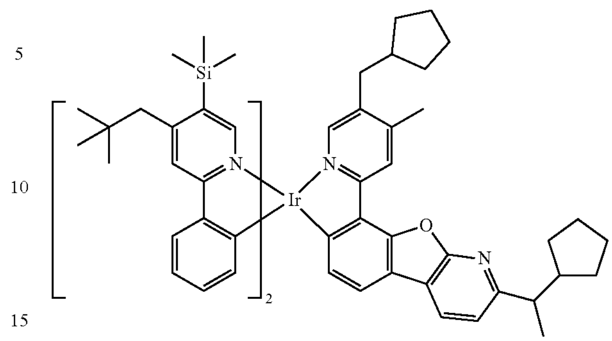
259
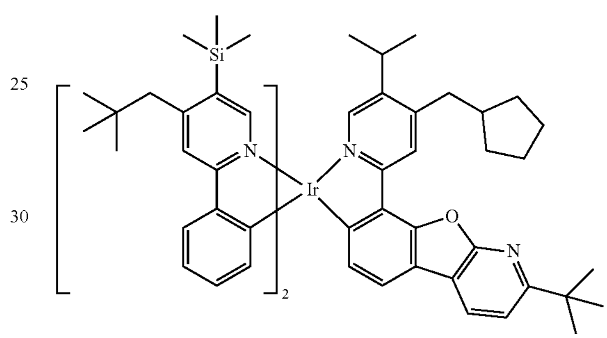
260
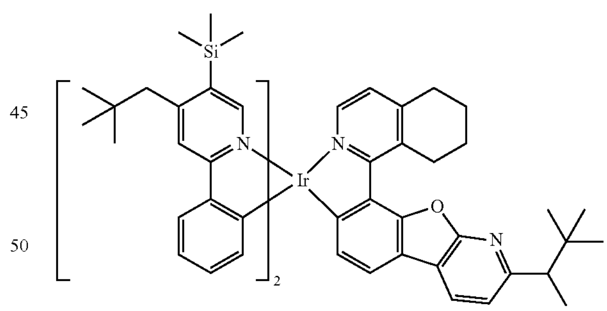
261
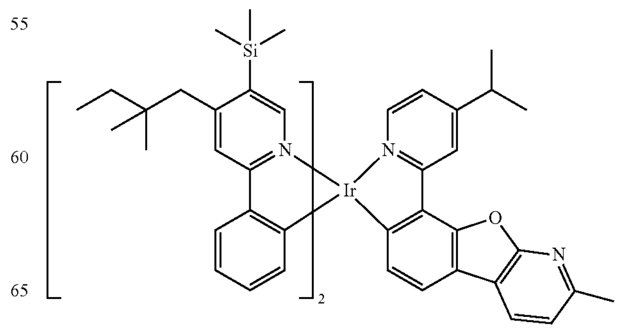

-continued
262
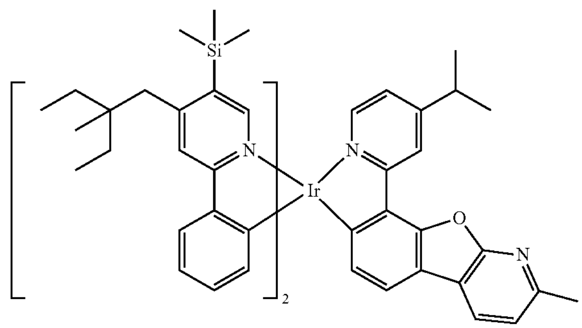
263
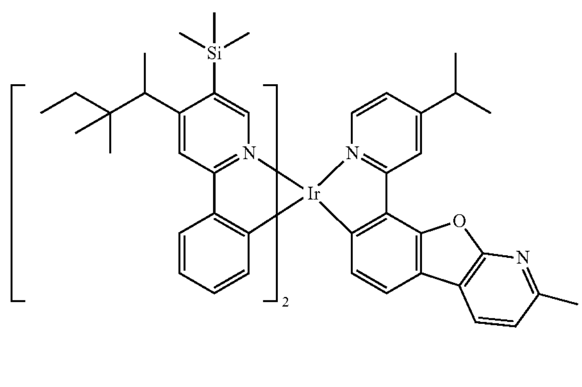
264
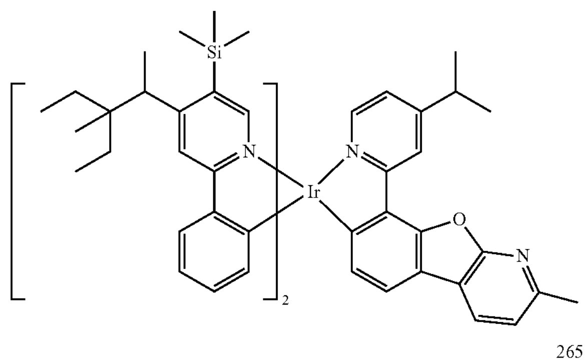
265
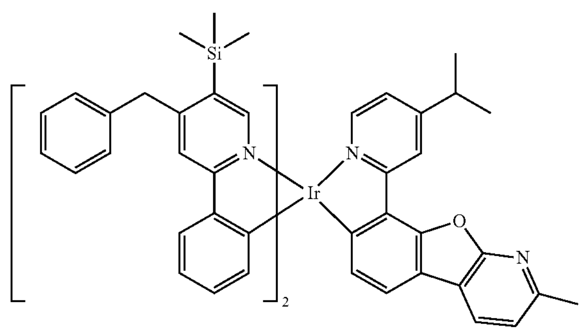
-continued
266
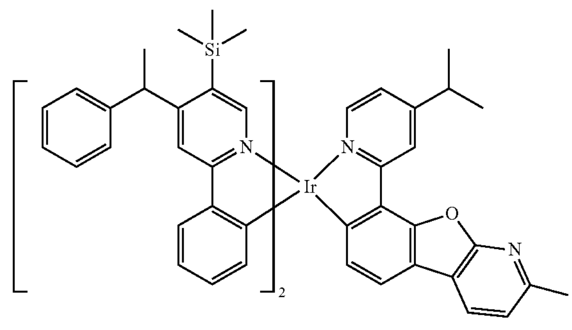
267
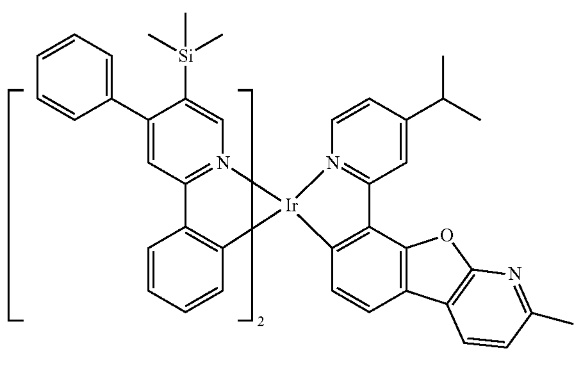
268
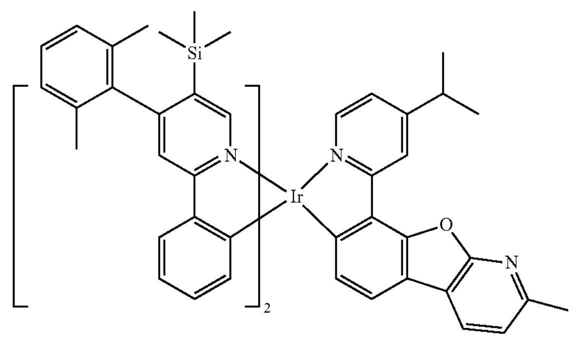
269
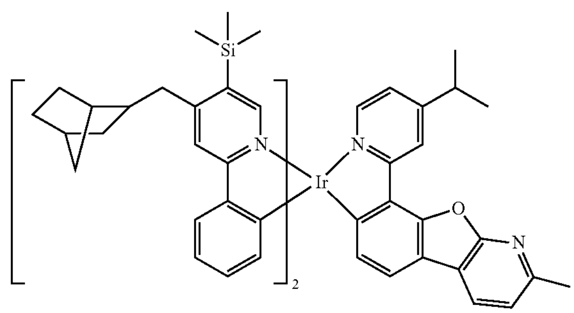

-continued
270
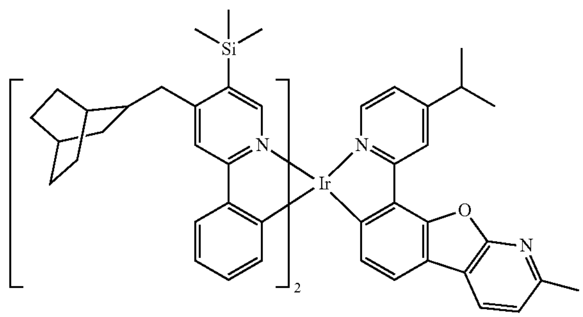
271
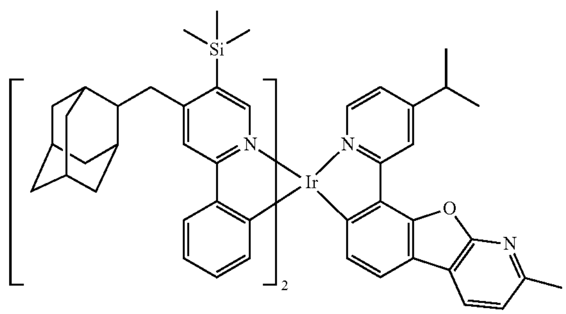
272
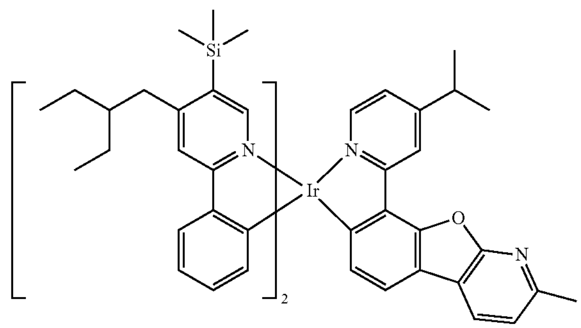
273
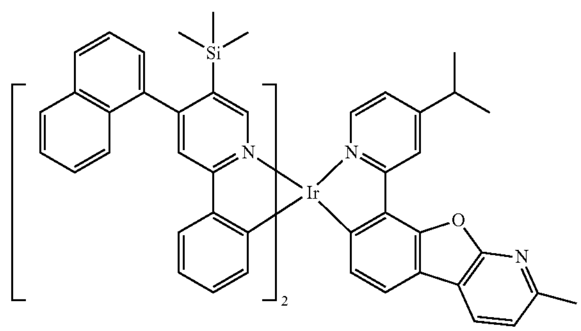
-continued
274
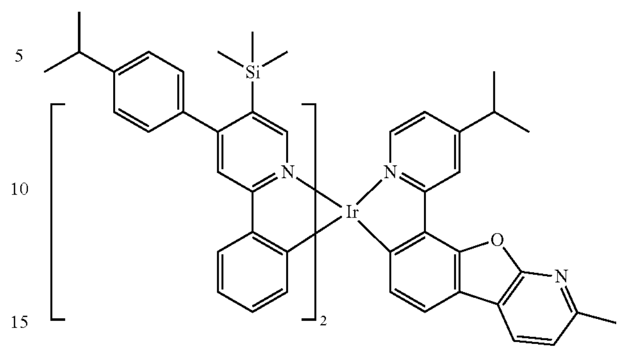
275
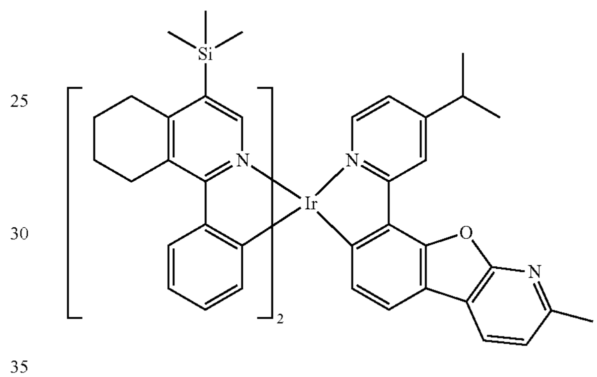
276
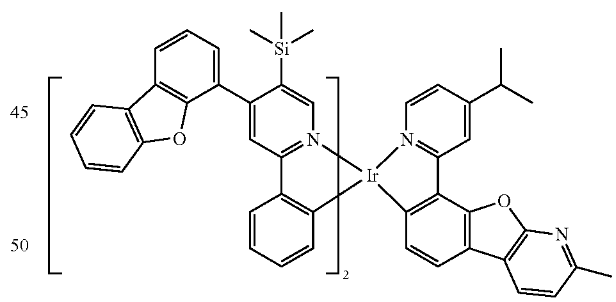
277
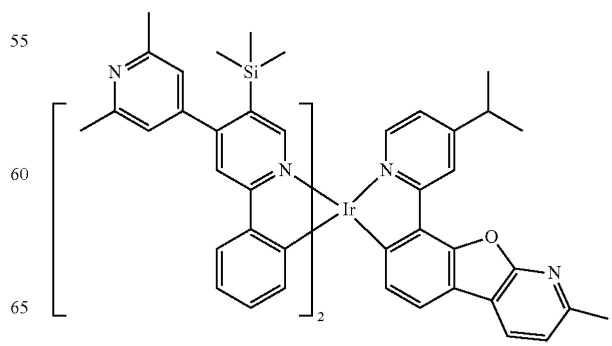

-continued
278
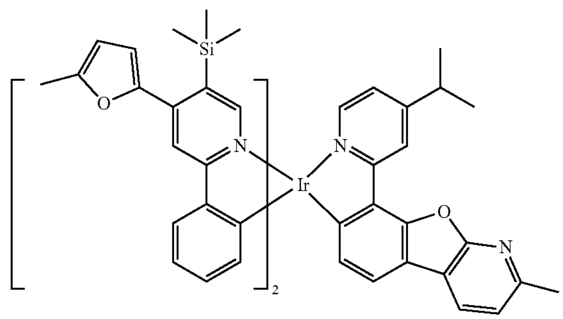
279
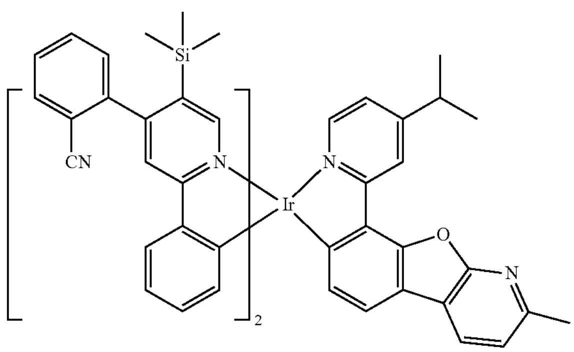
280
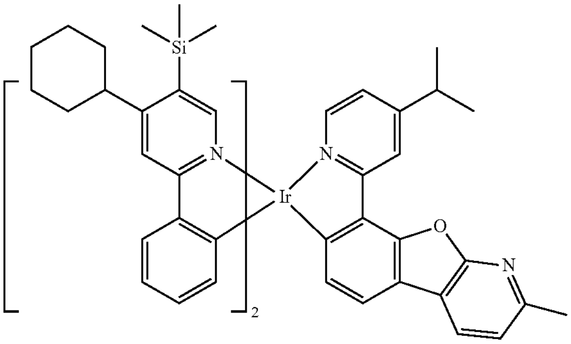
281
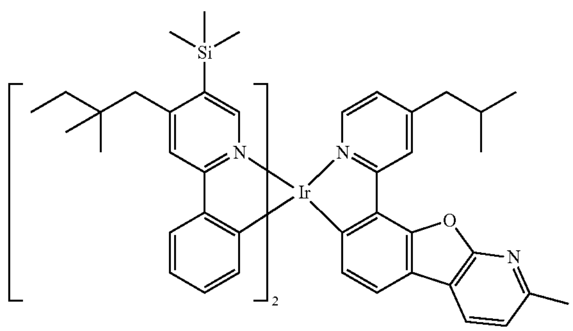
-continued
282
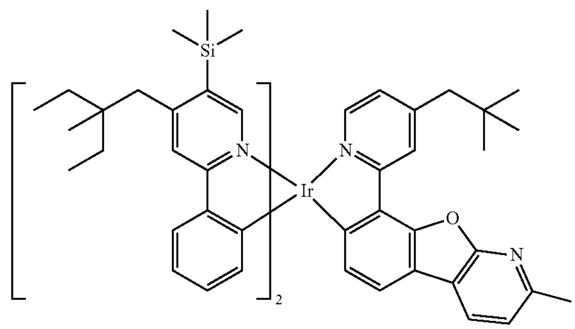
283
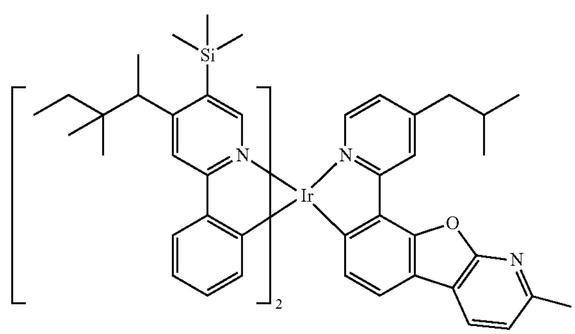
284
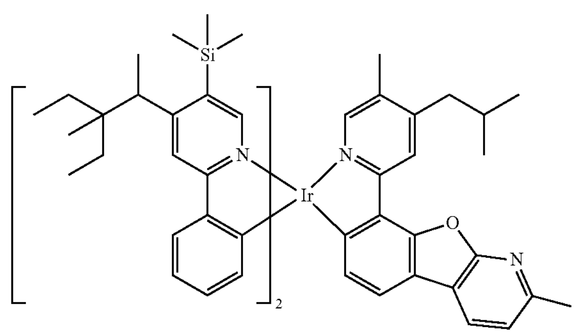
285
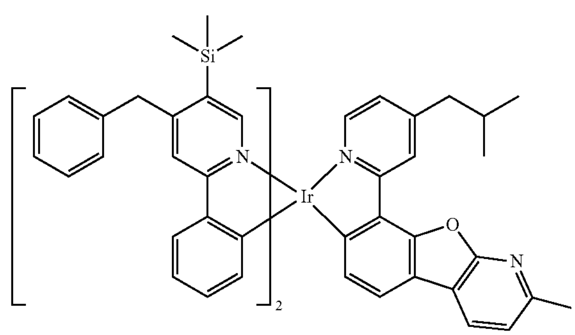

-continued
286
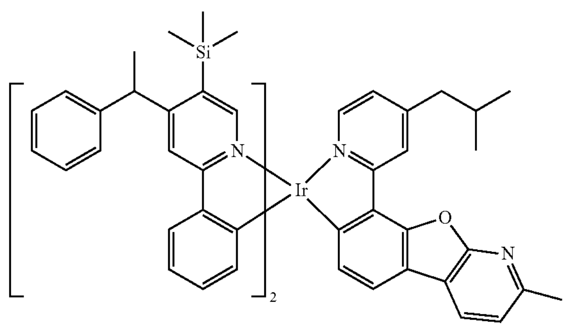
287
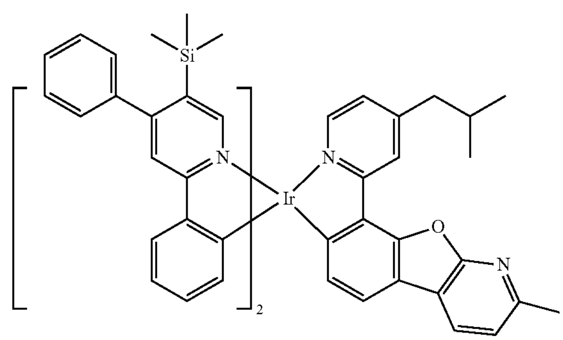
288
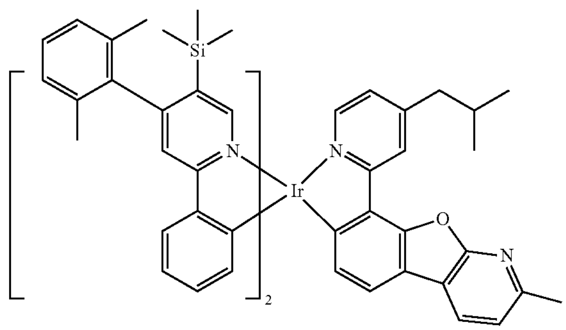
289
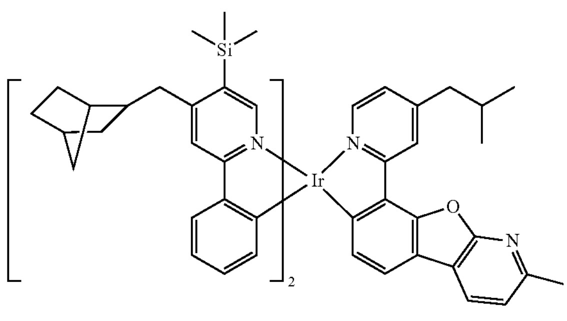
-continued
290
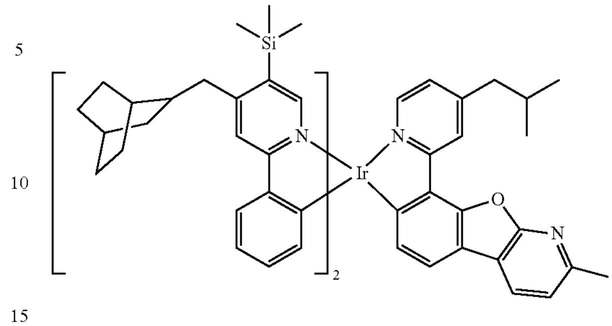
291
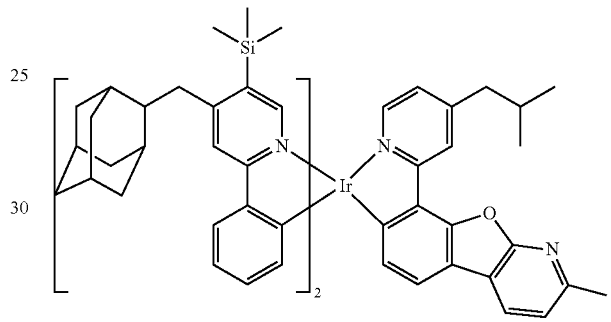
292
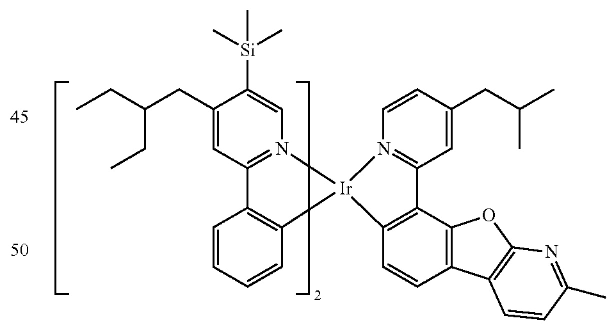
293
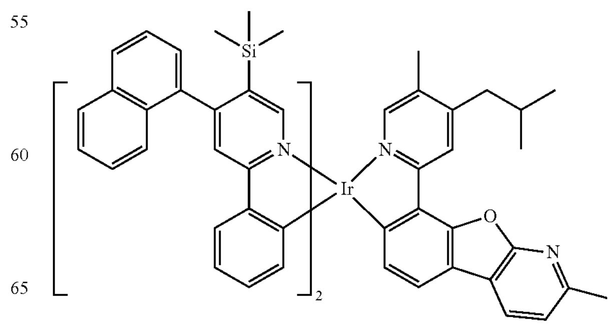

-continued
294
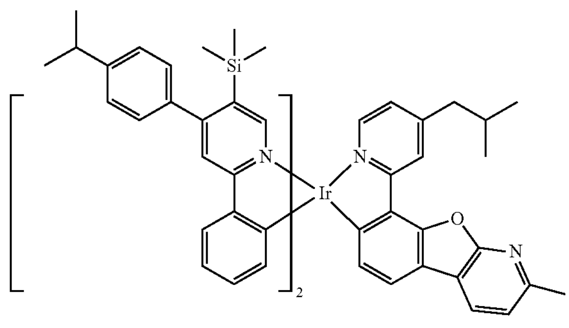
295
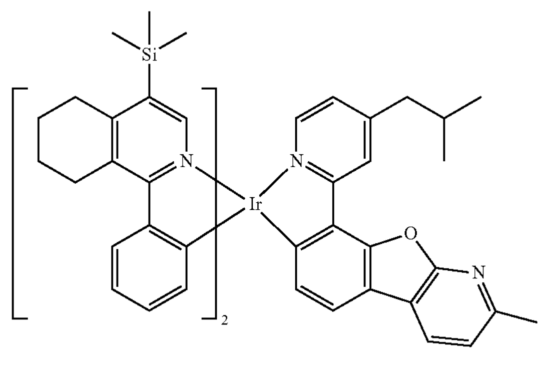
296
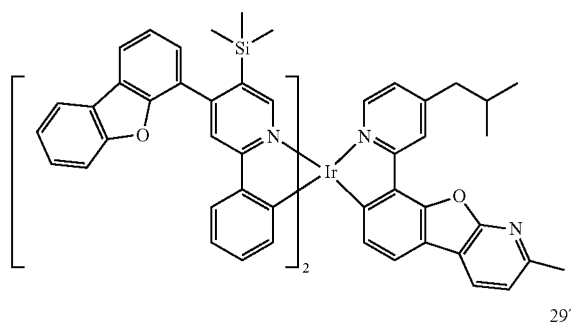
297
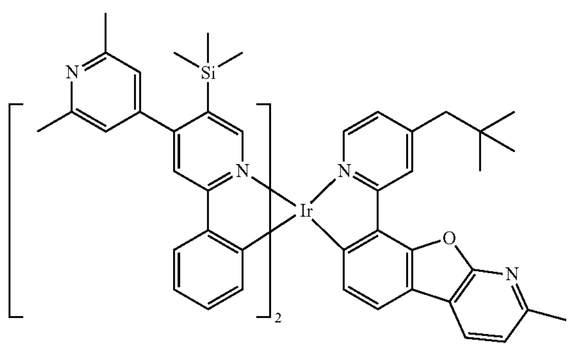
-continued
298
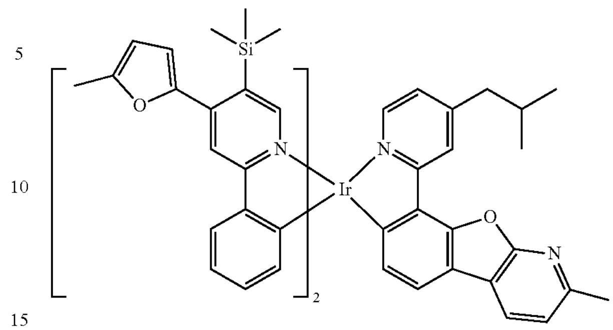
299
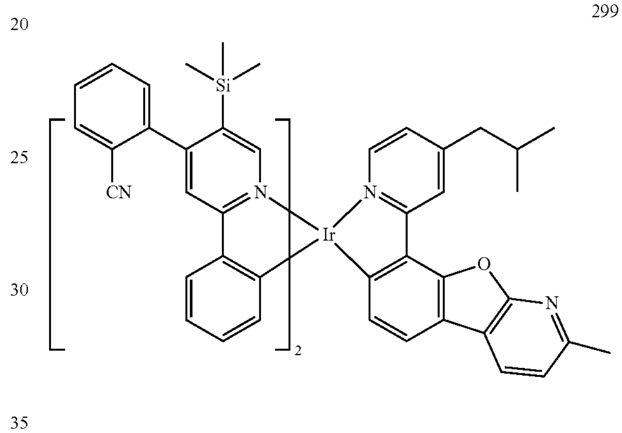
300
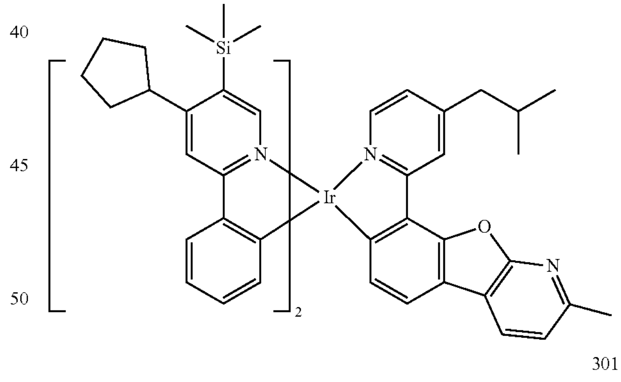
301
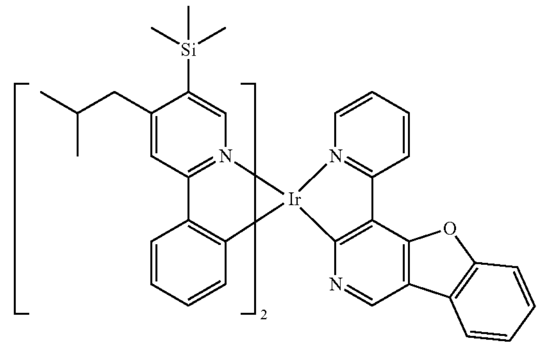

302
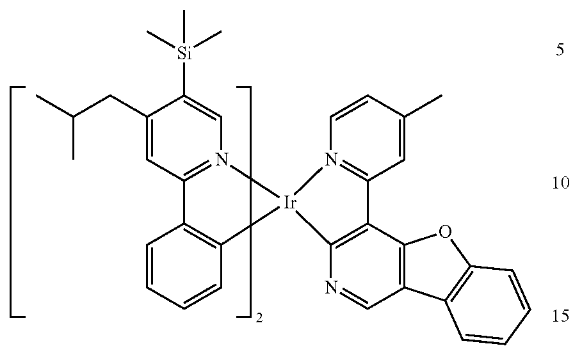
303
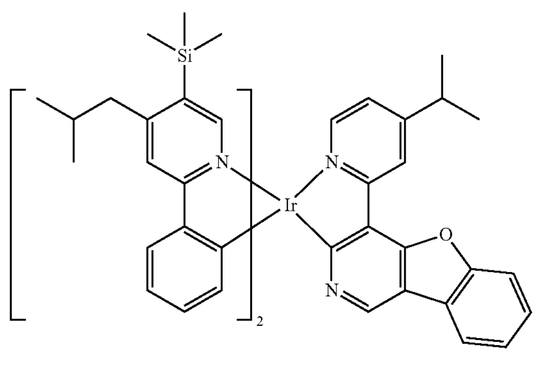
304
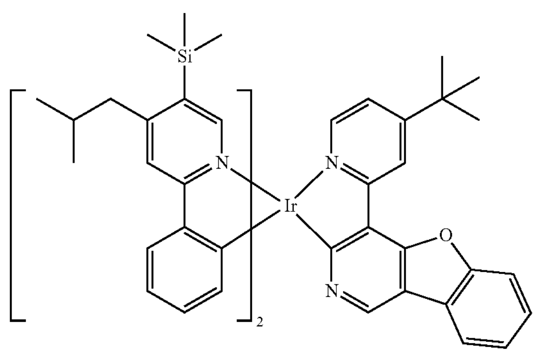
305
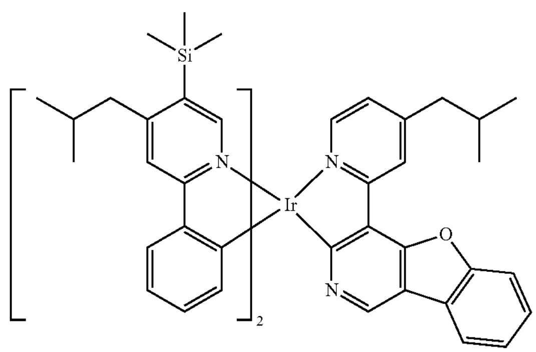
306
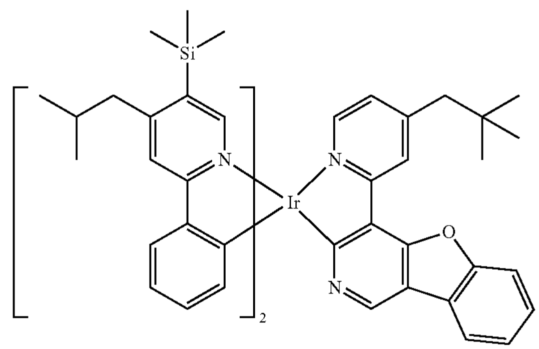
307
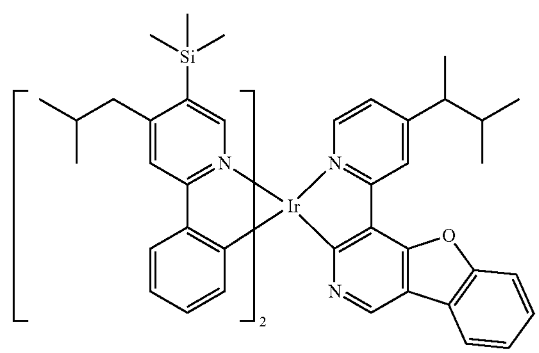
308
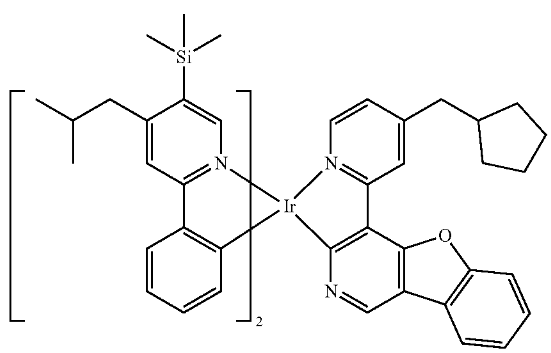
309
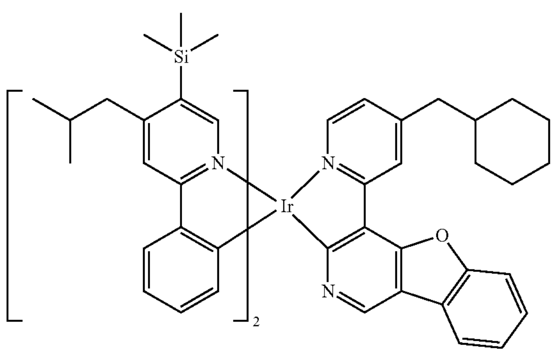

-continued
310
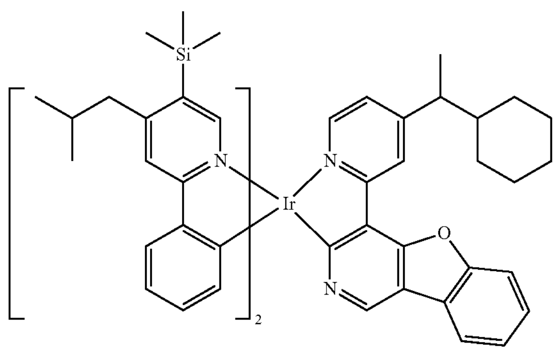
311
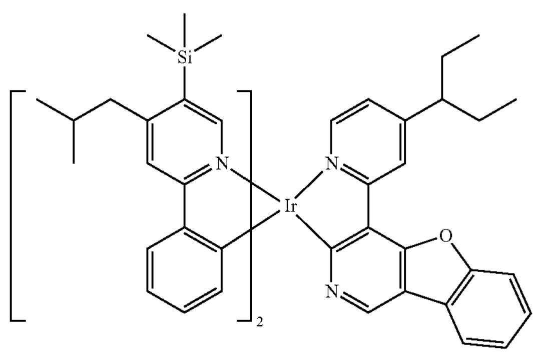
312
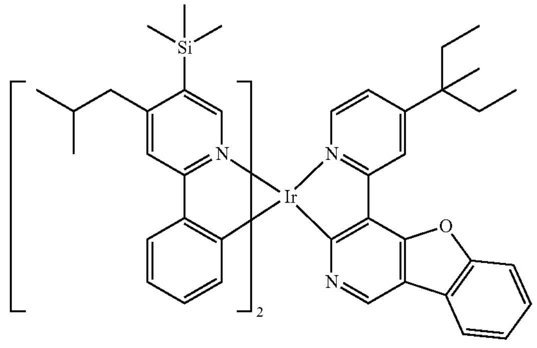
313
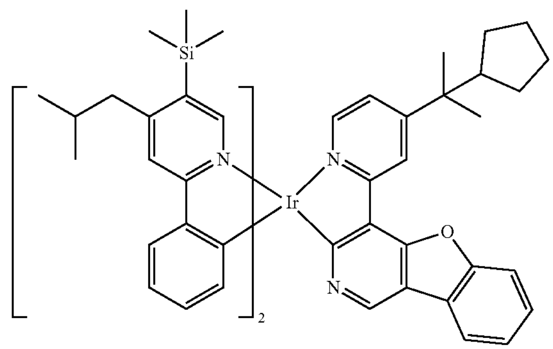
-continued
314
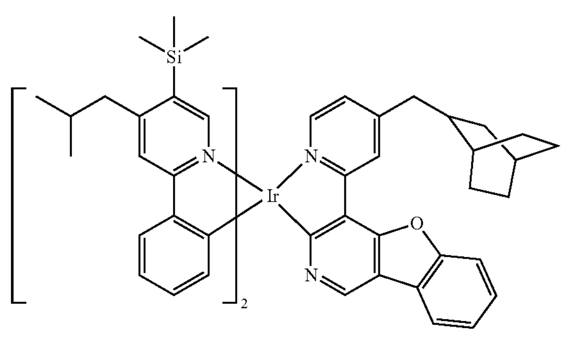
315
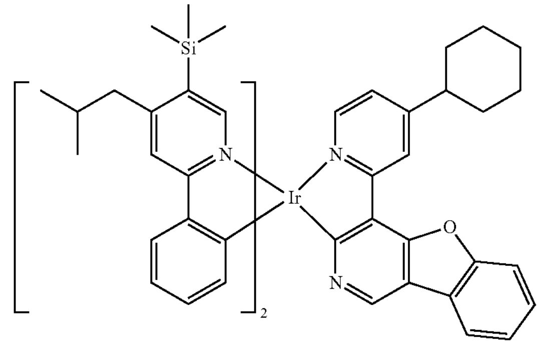
316
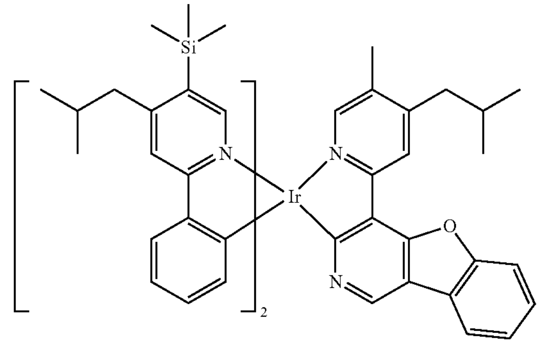
317
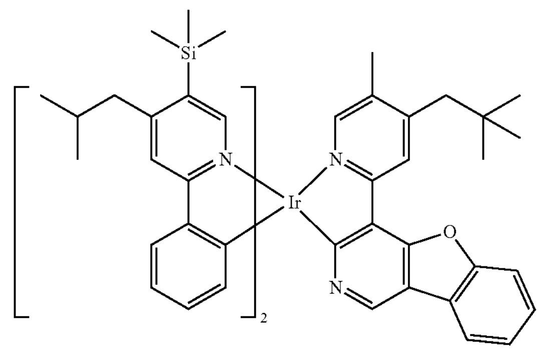

-continued
318
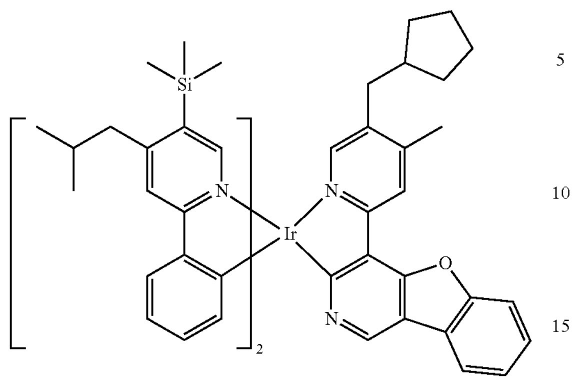
319
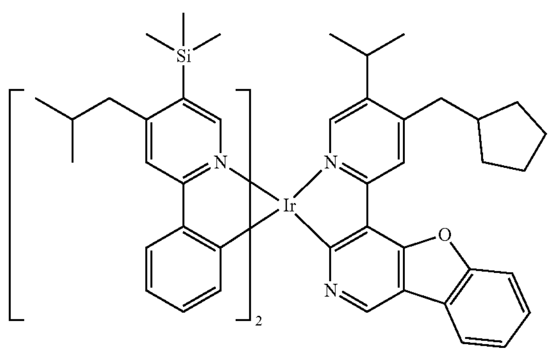
320
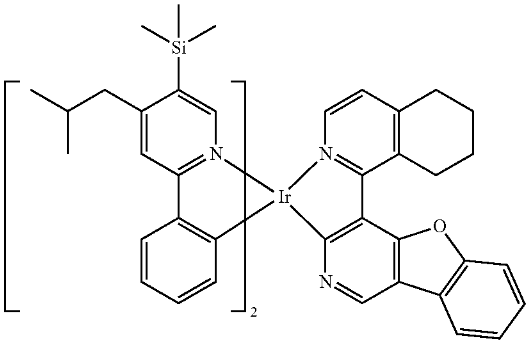
320
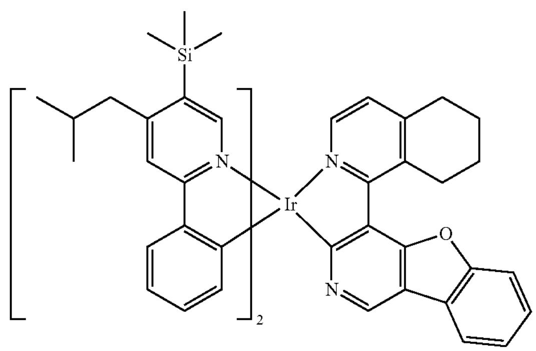
-continued
321
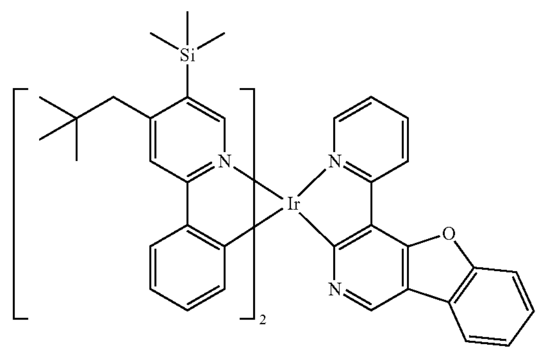
322
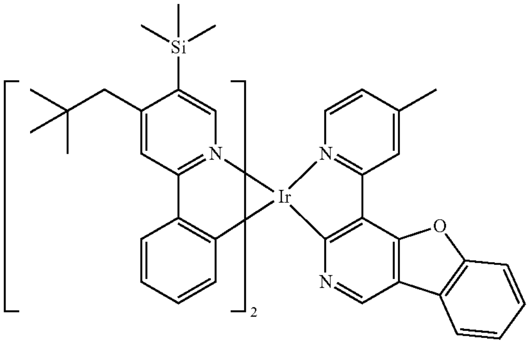
323
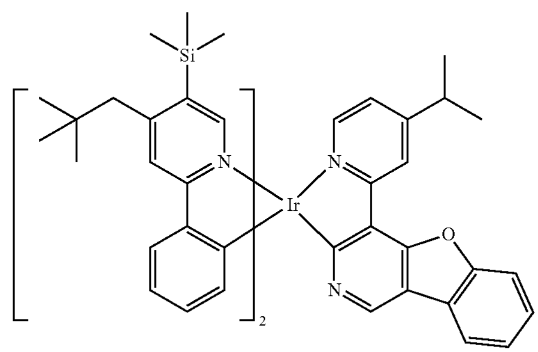
324
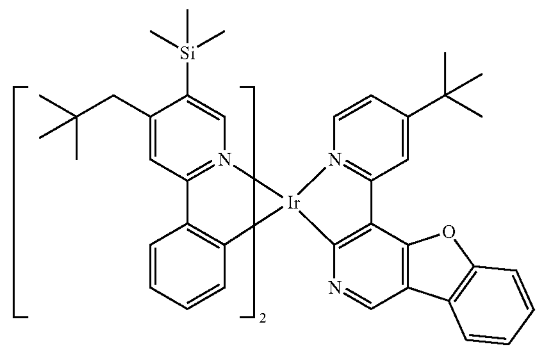

-continued
325
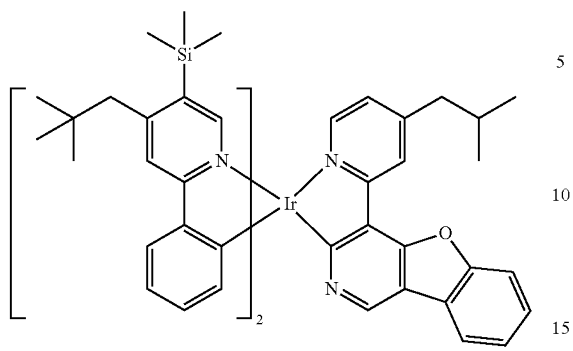
326
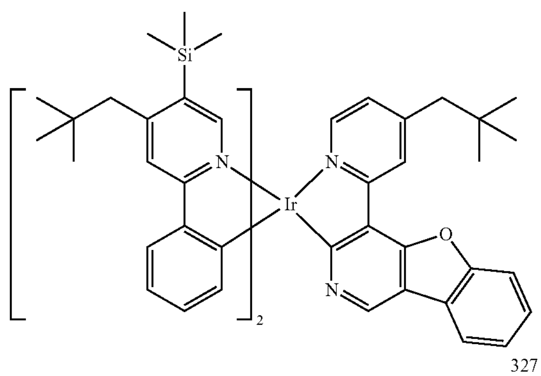
327
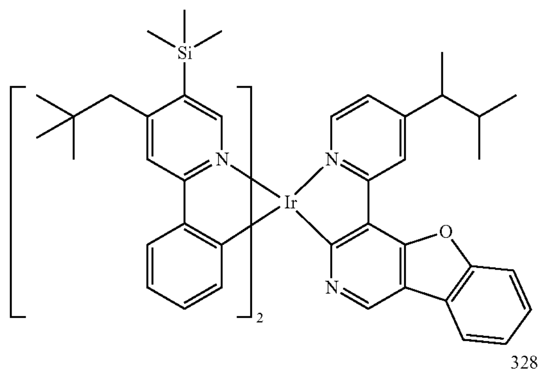
328
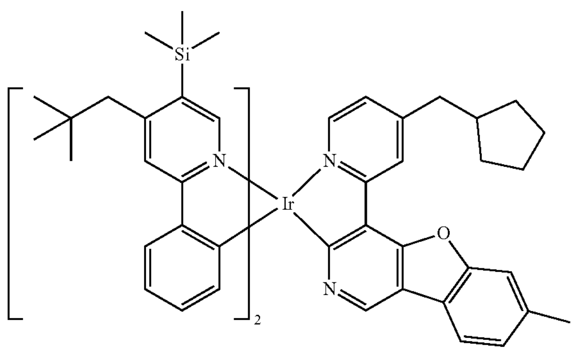
-continued
329
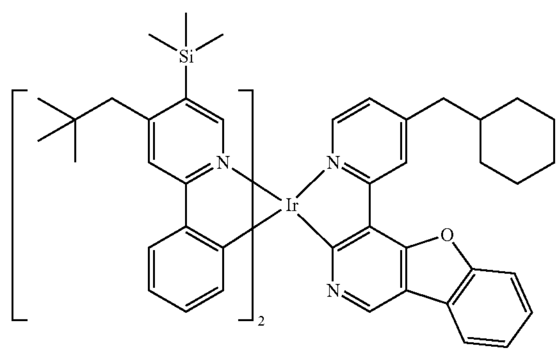
330
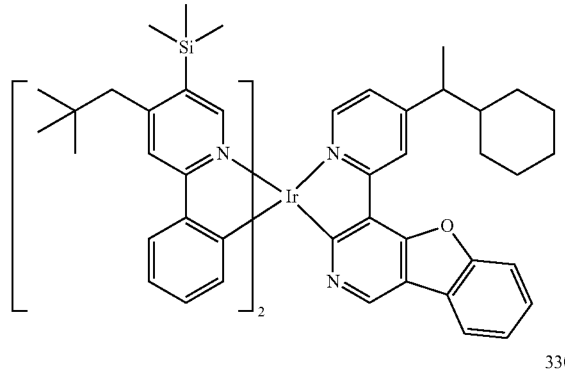
330
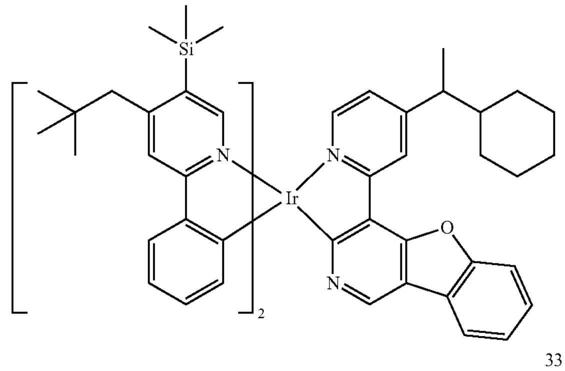
331
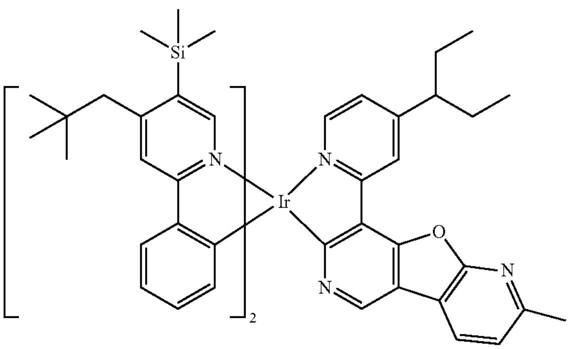

-continued
332
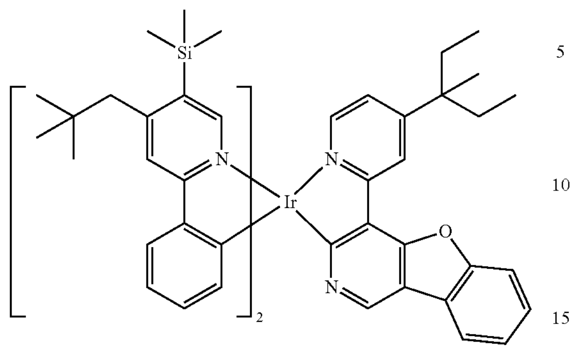
333
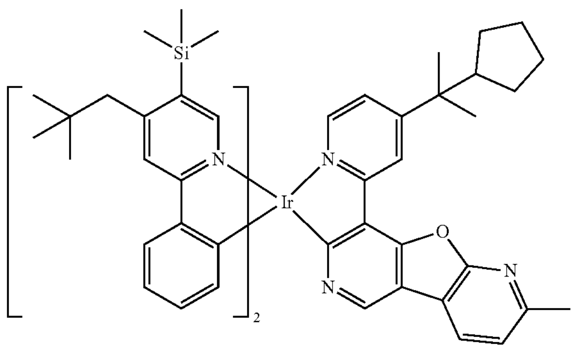
334
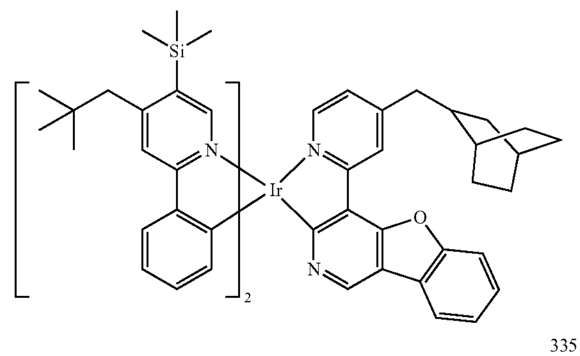
335
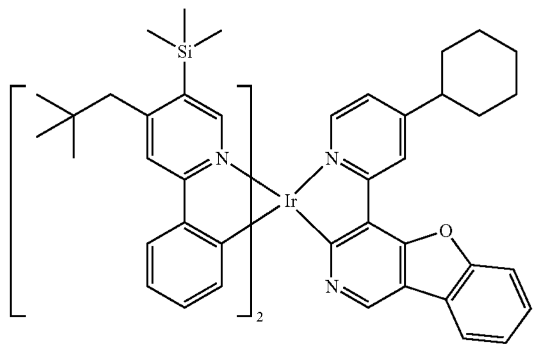
-continued
336
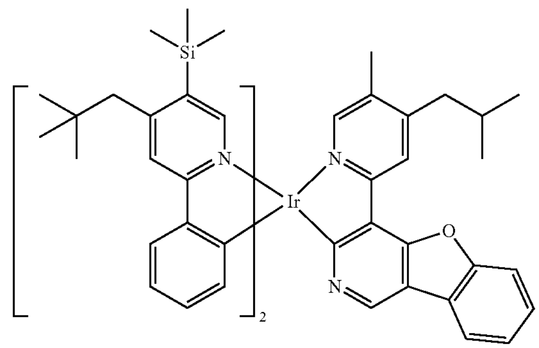
337
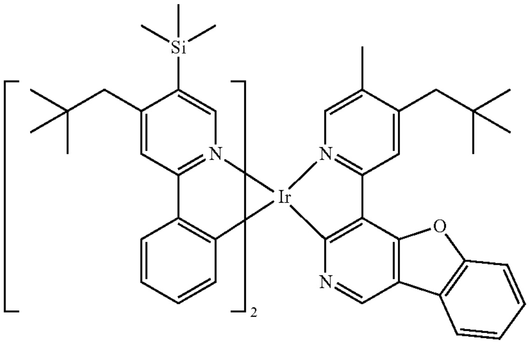
338
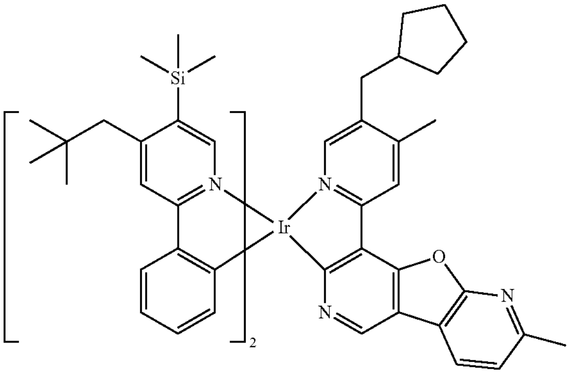
339
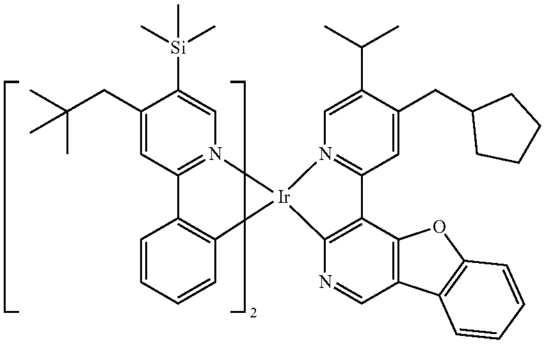

-continued
340
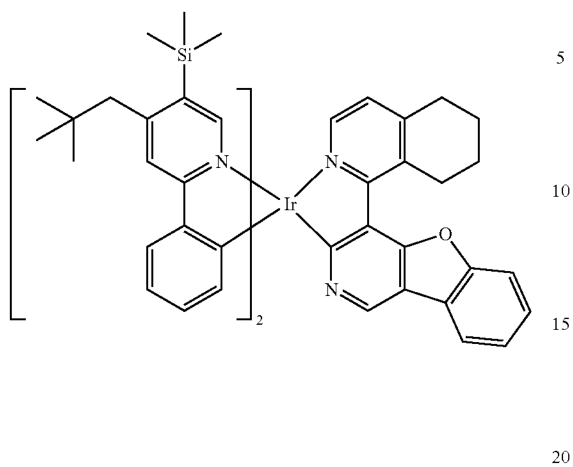
341
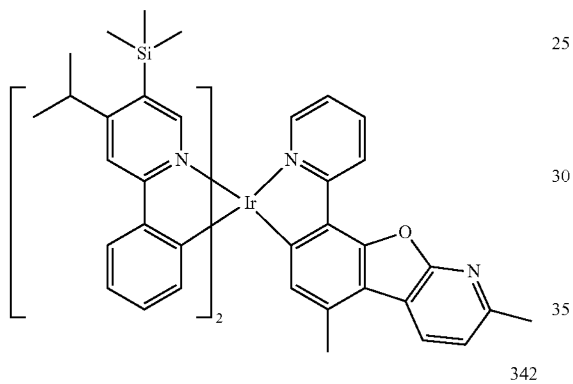
342
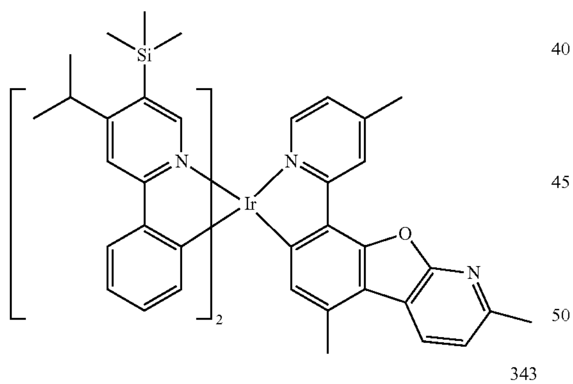
343
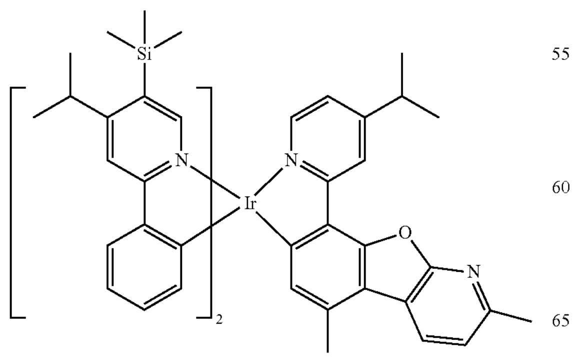
-continued
344
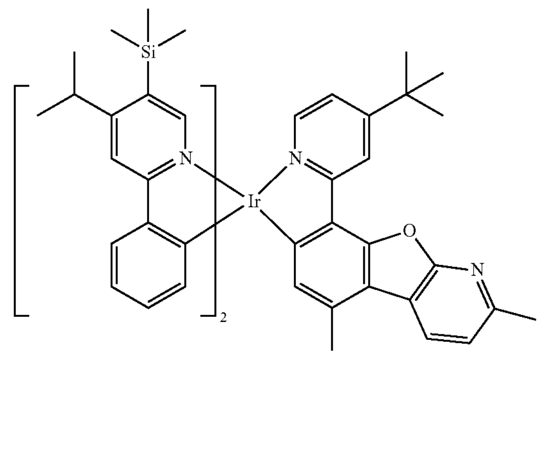
345
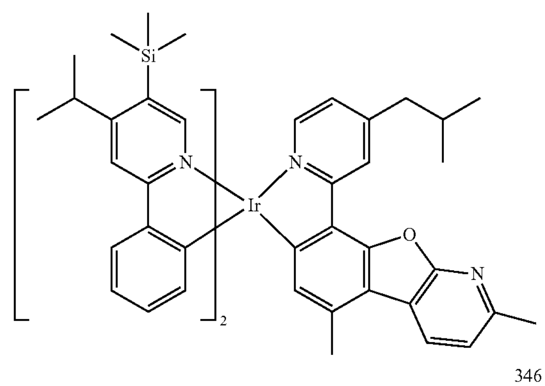
346
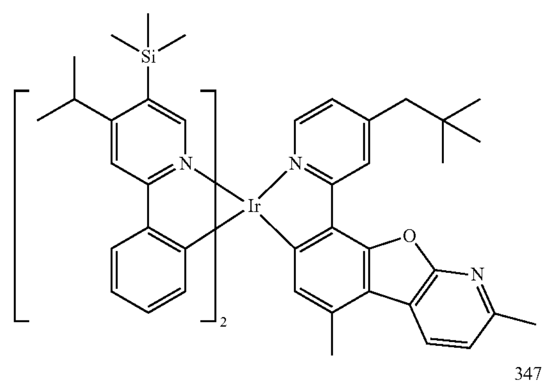
347
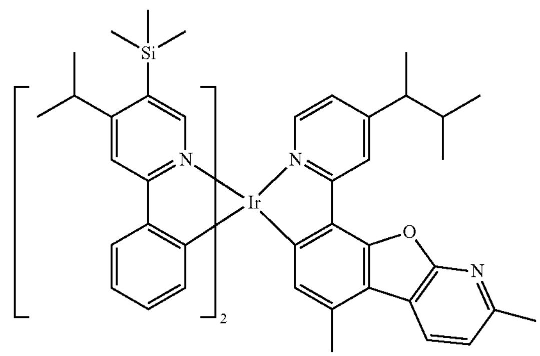

-continued
348
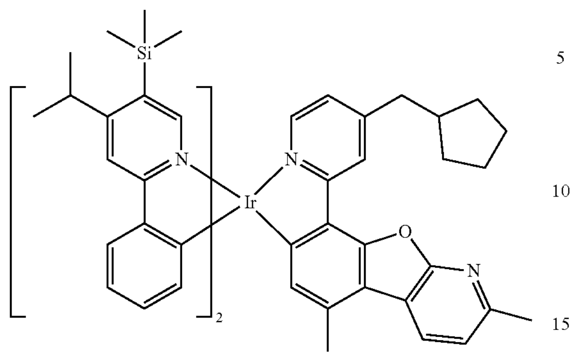
349
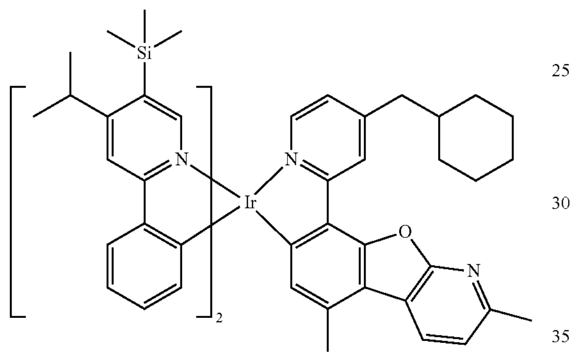
350
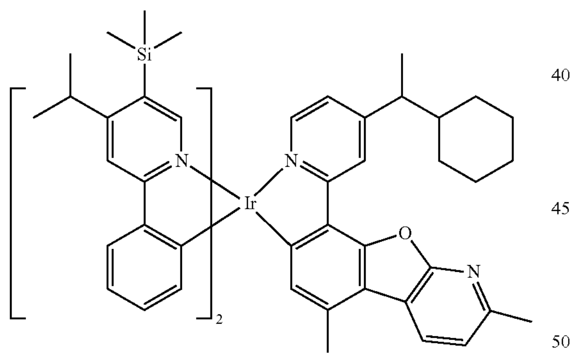
351
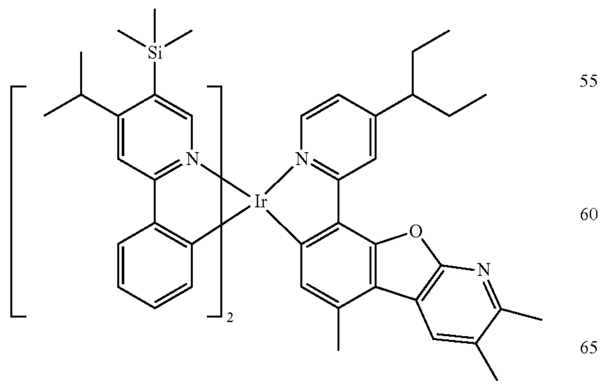
-continued
352
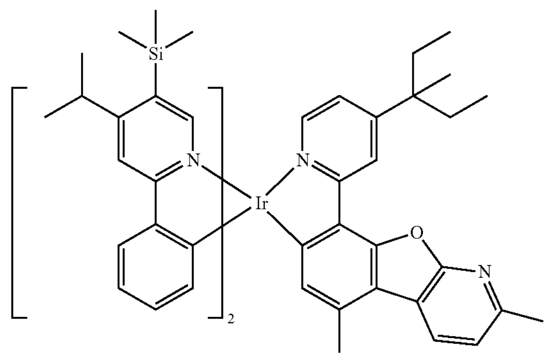
353
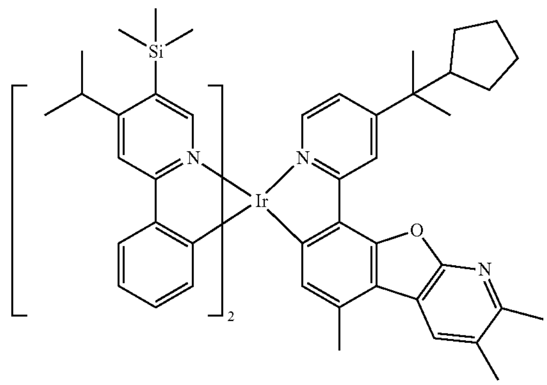
354
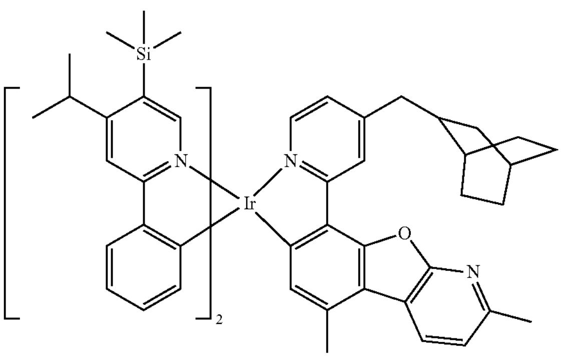
355
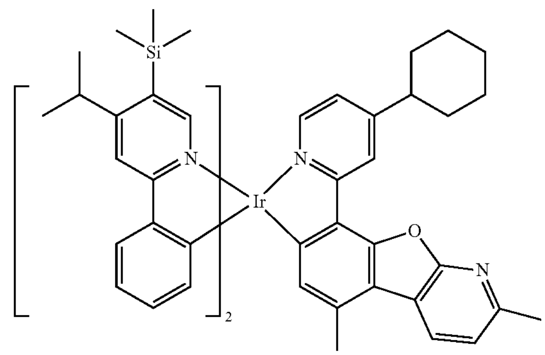

-continued
356
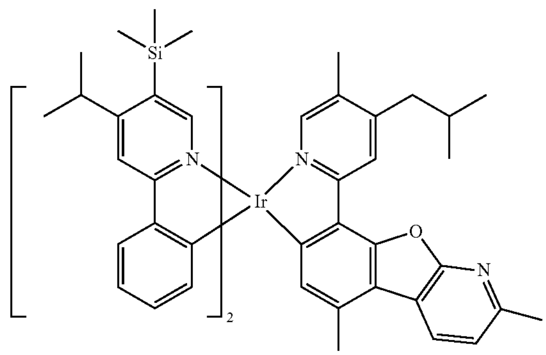
357
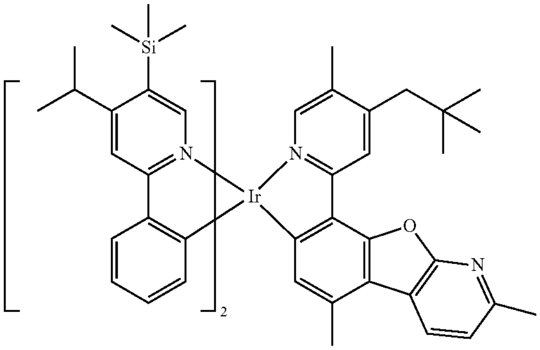
358
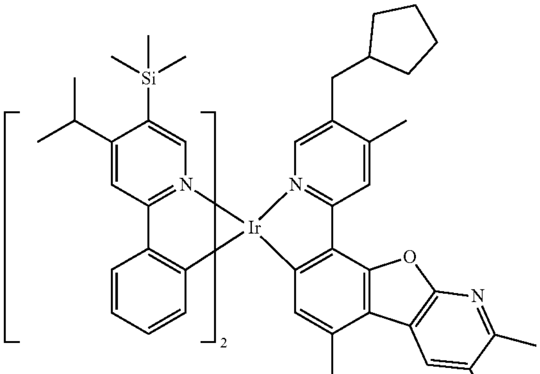
359
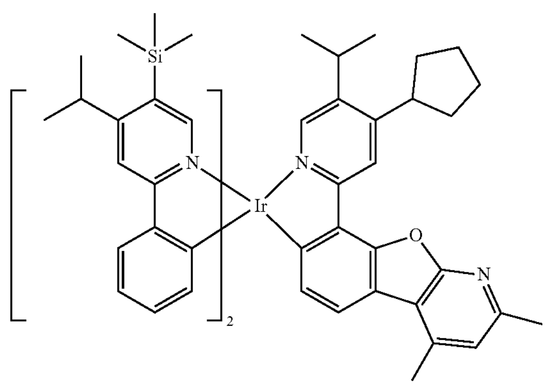
-continued
360
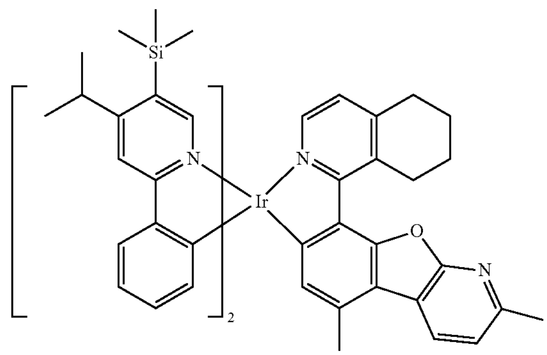
361
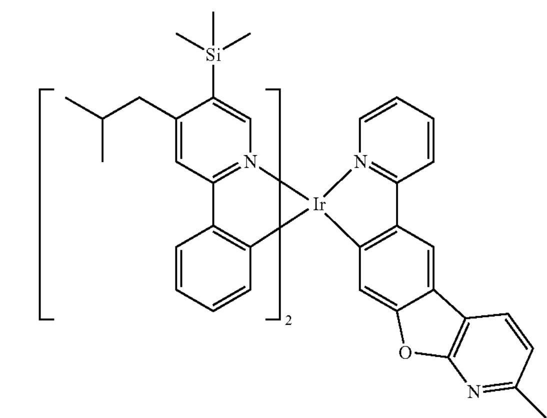
362
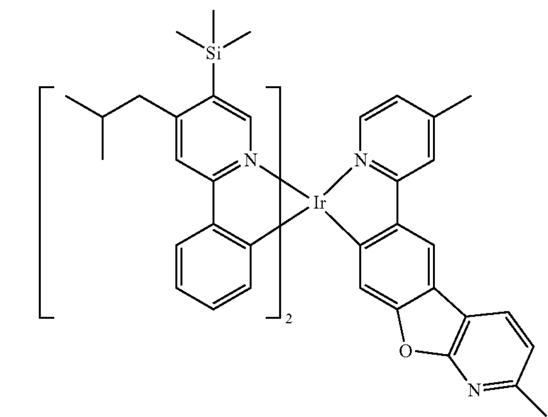

-continued
363
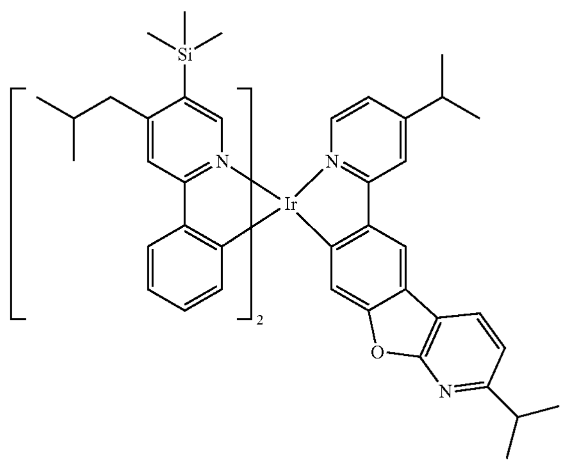
364
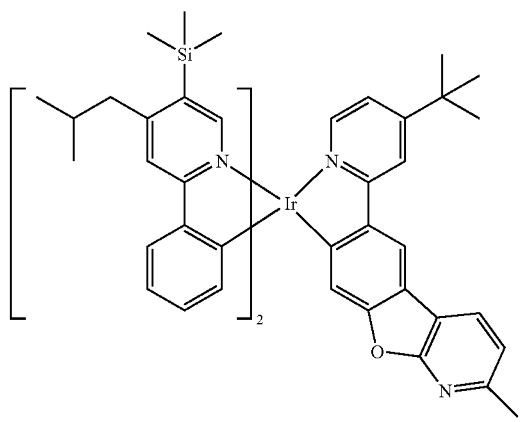
365
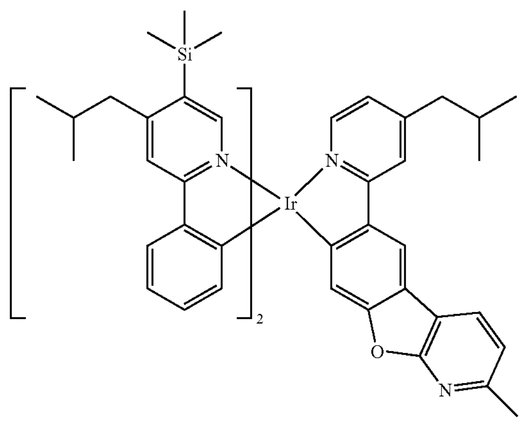
-continued
366
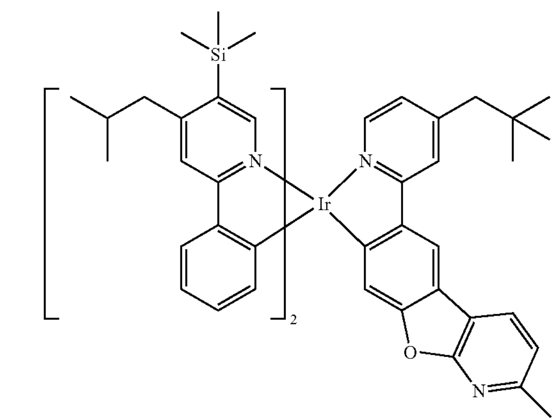
367
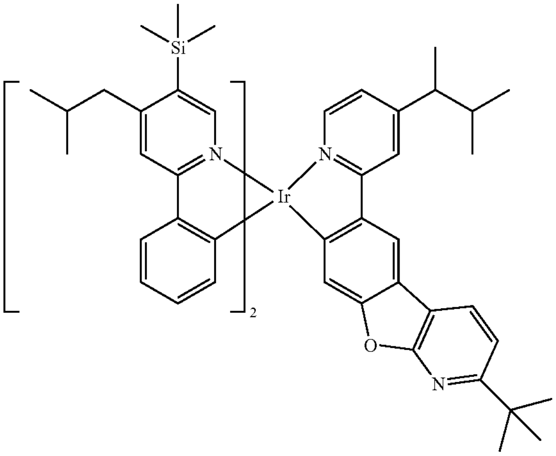
368
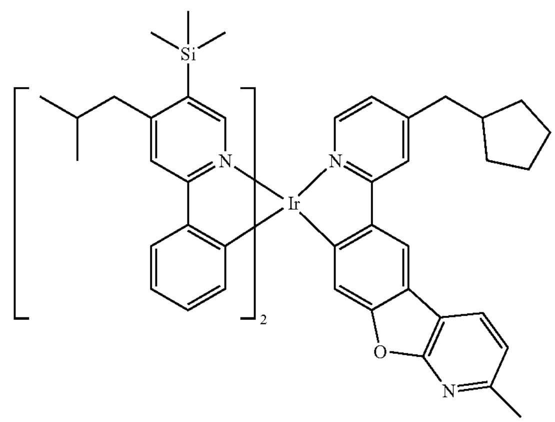

-continued
369
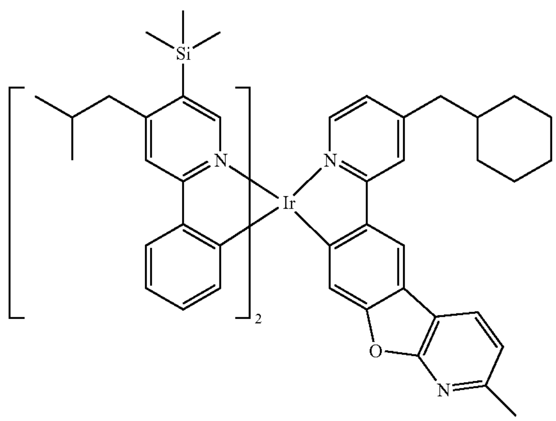
370
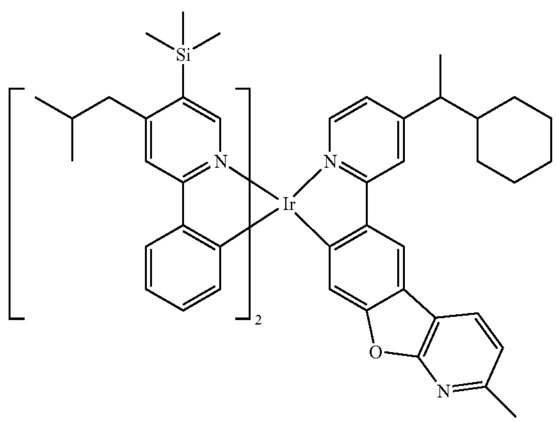
371
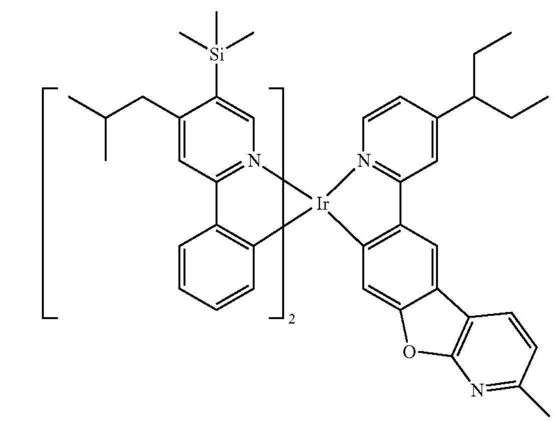
-continued
372
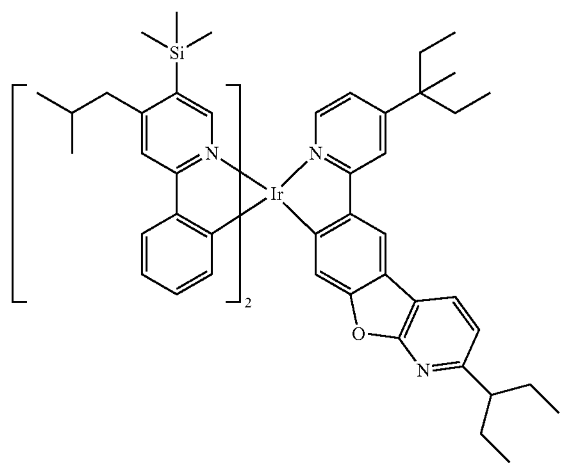
373
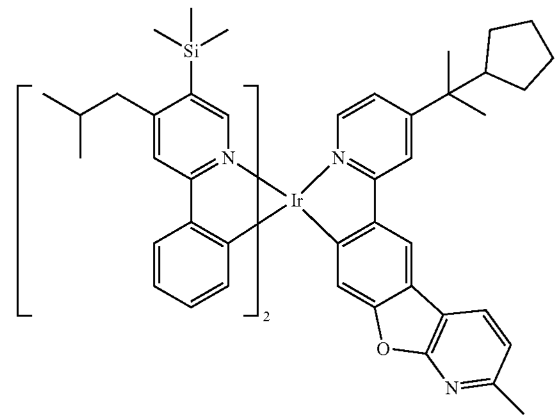
374
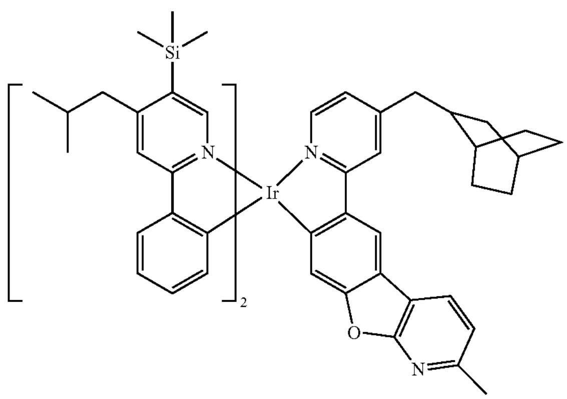

-continued
375
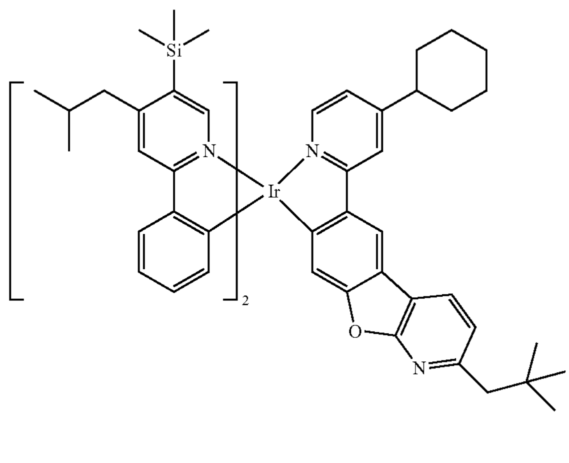
376
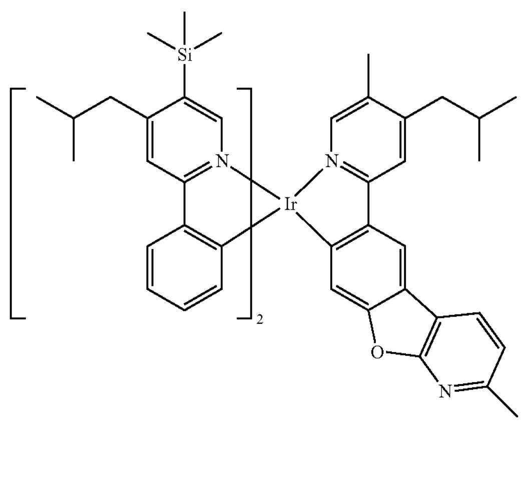
377
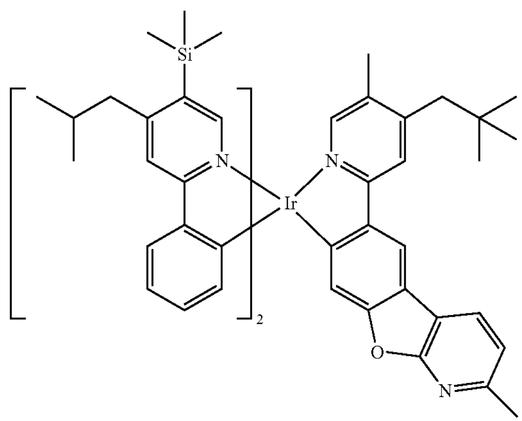
-continued
378
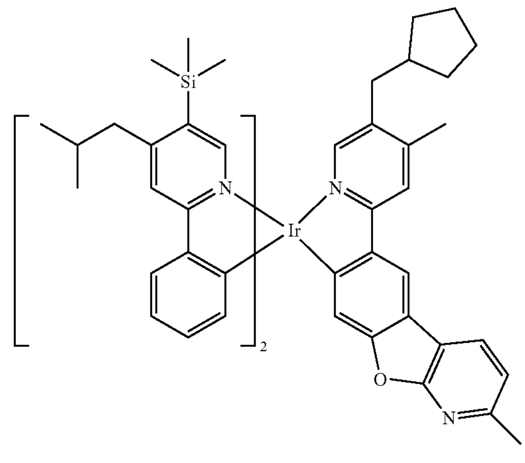
379
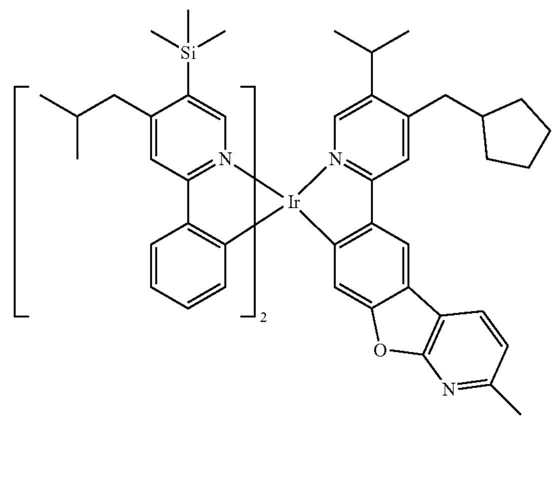
380
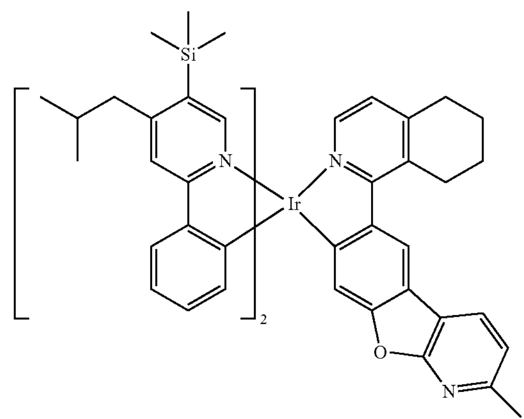

-continued
381
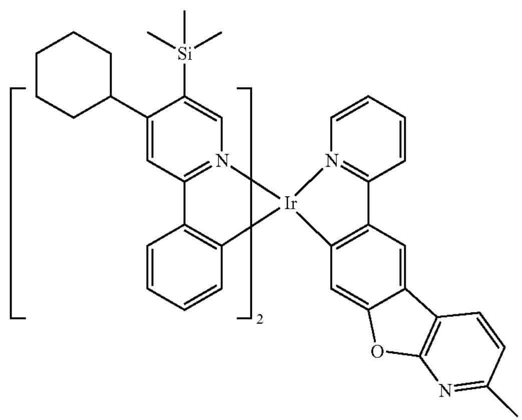
382
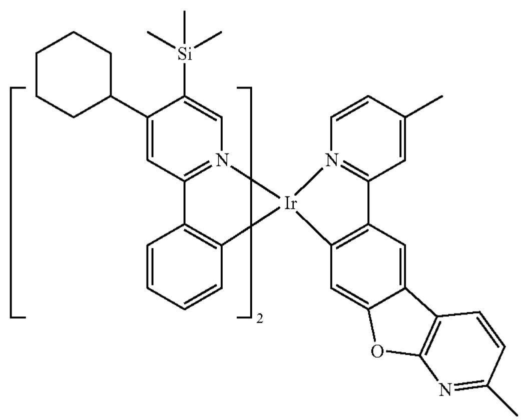
383
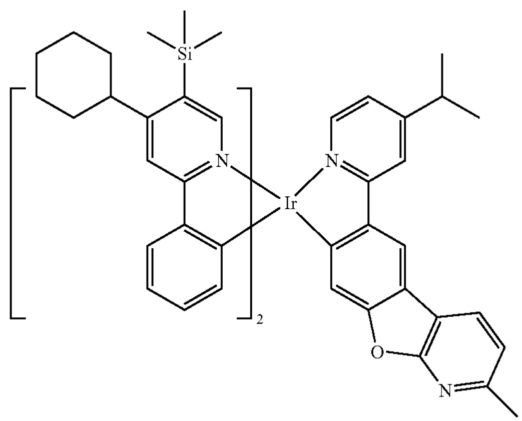
-continued
384
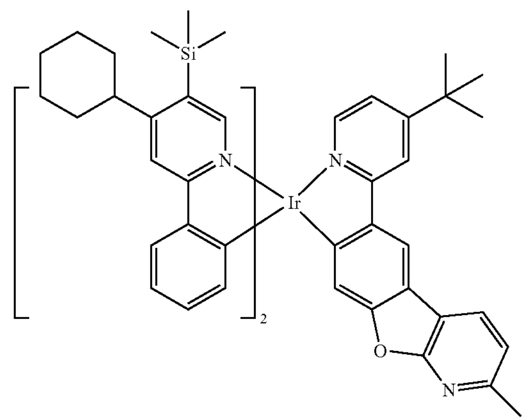
385
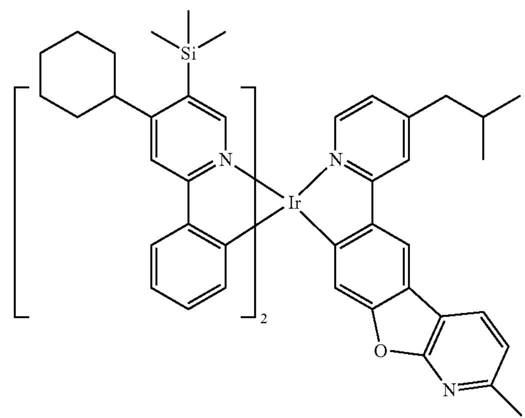
386
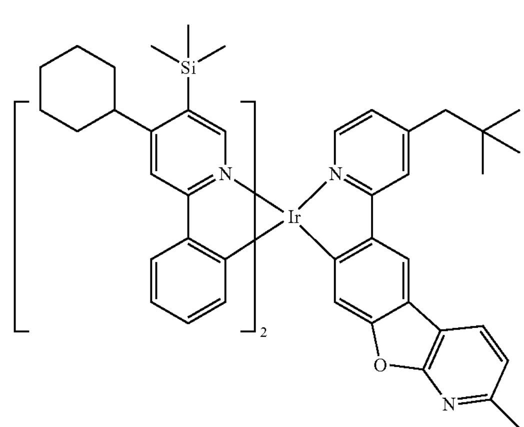

387
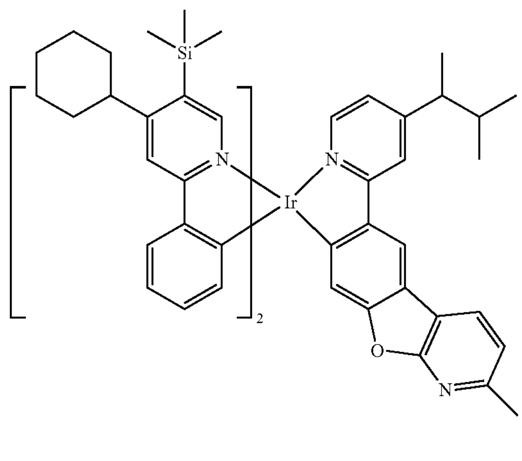
388
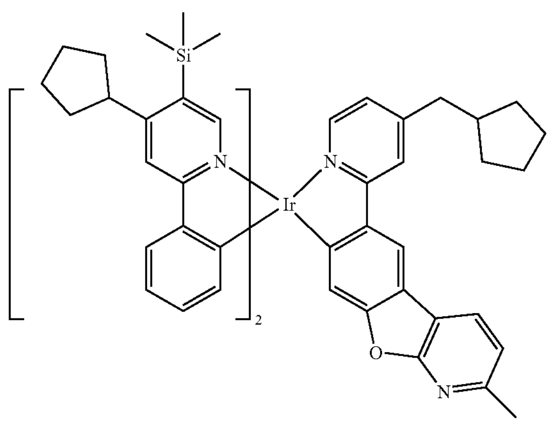
389
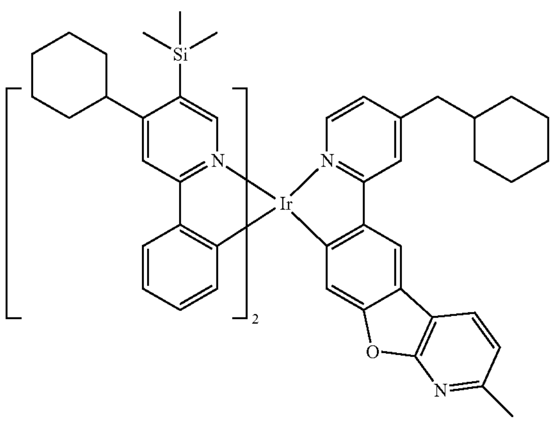
390
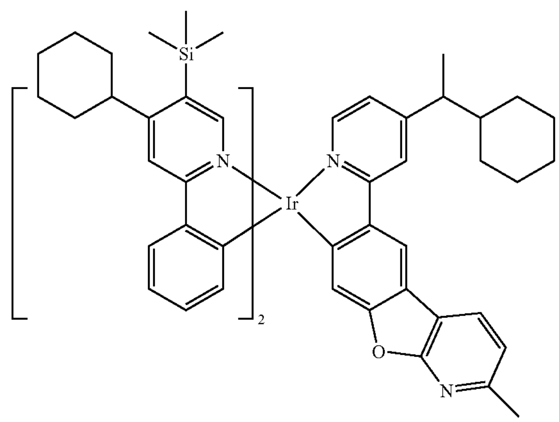
391
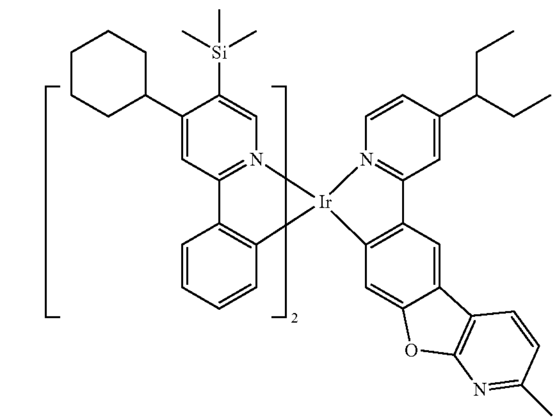
392
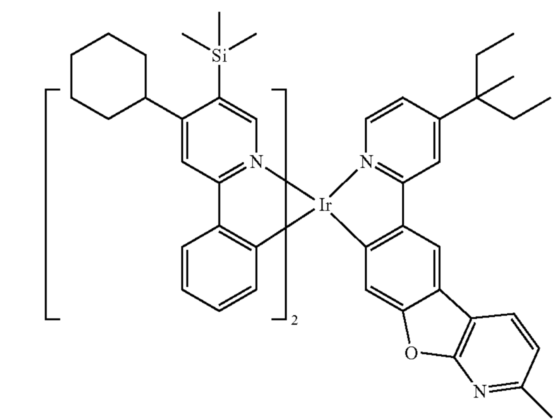

-continued
393
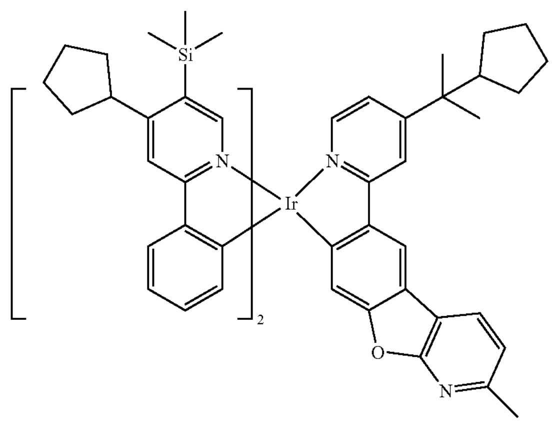
394
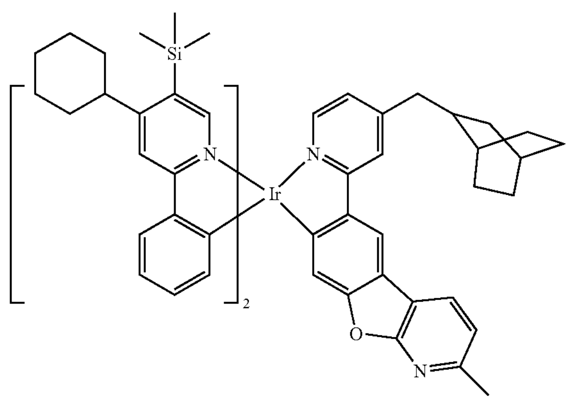
395
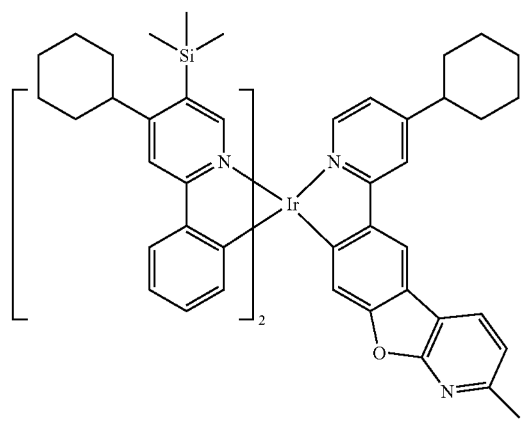
-continued
396
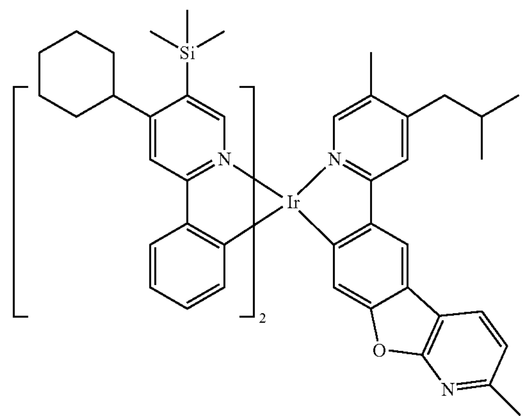
397
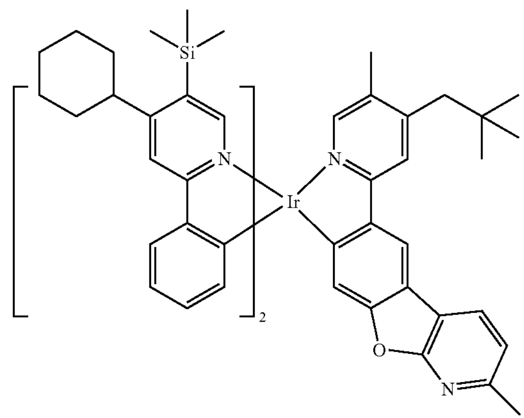
398
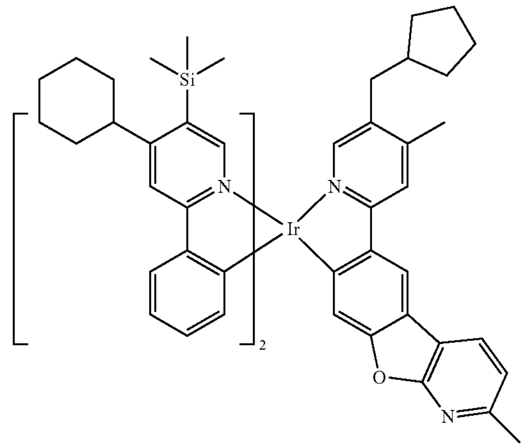

-continued
399
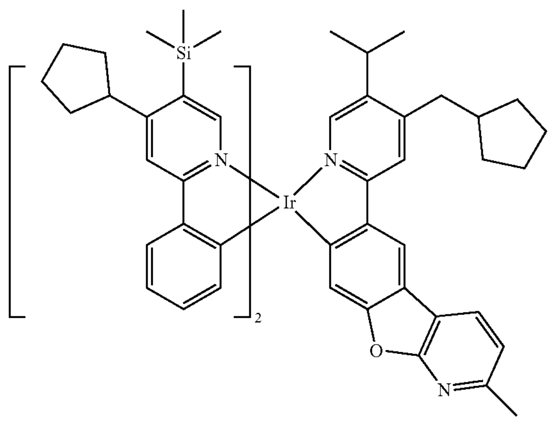
400
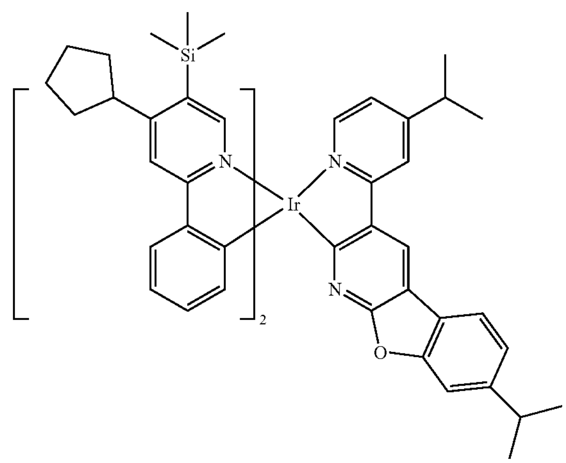
401
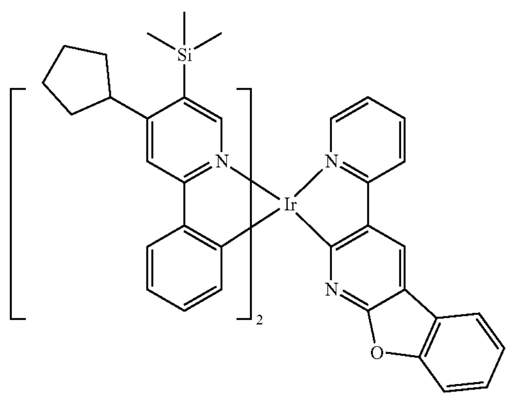
-continued
402
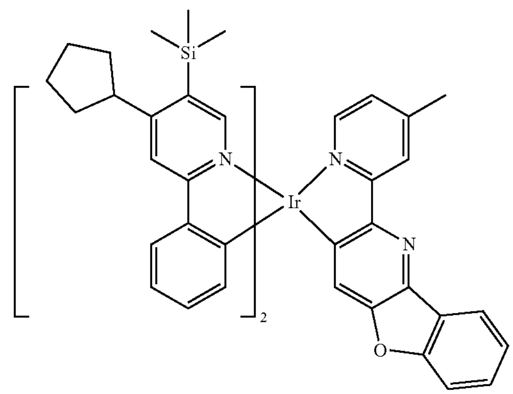
403
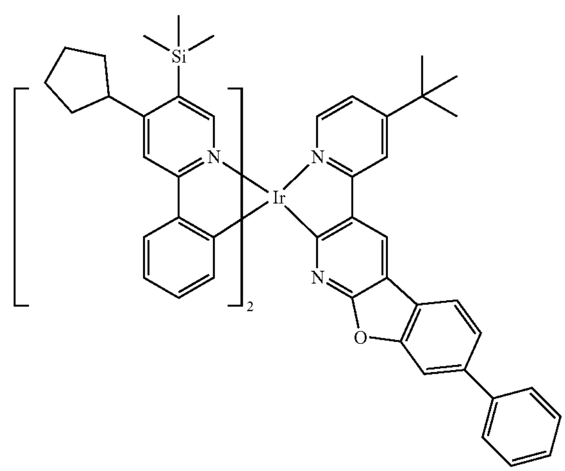
404

-continued
405
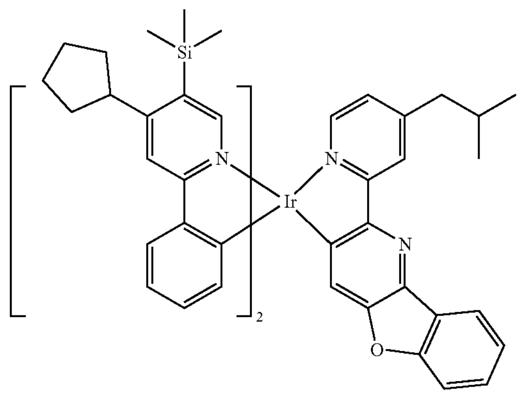
406
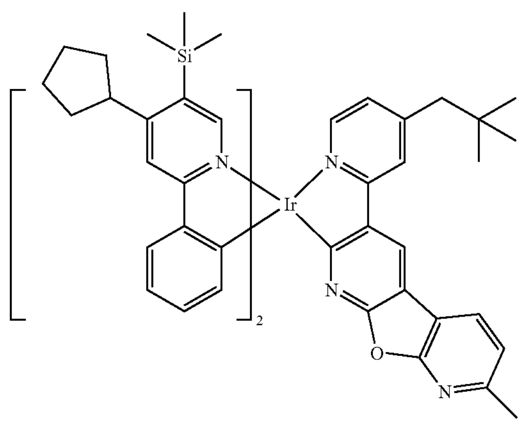
407
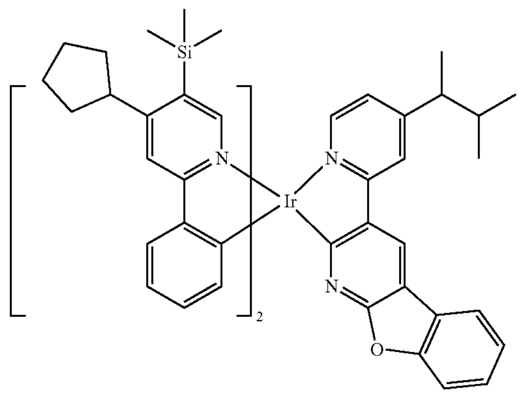
-continued
408
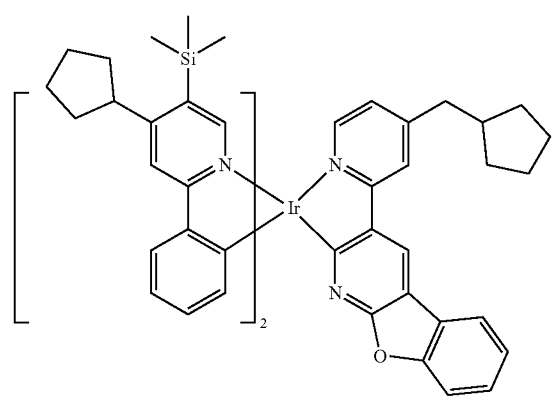
409
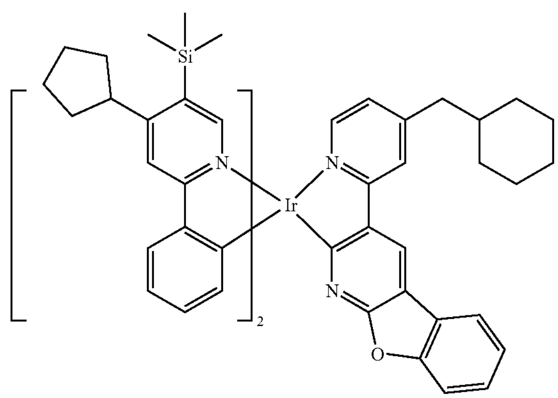
410
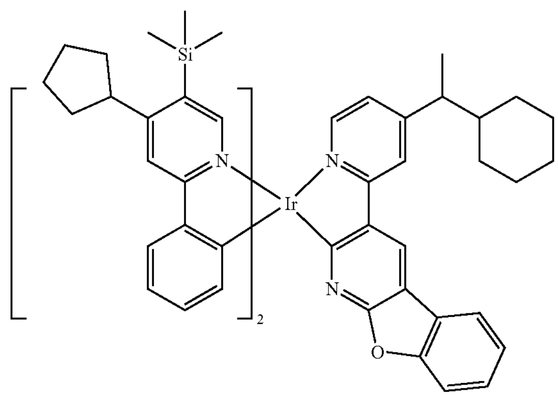

-continued
411
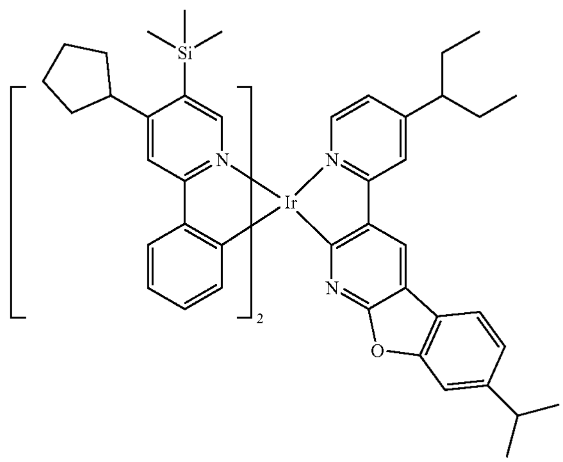
412
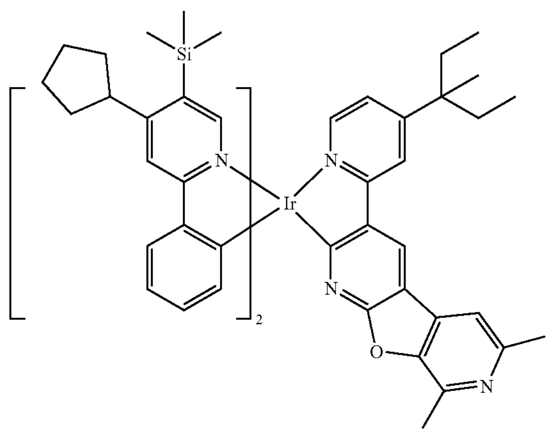
413
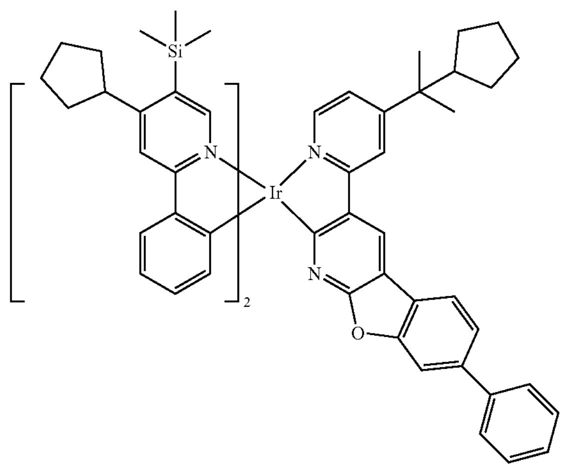
-continued
414
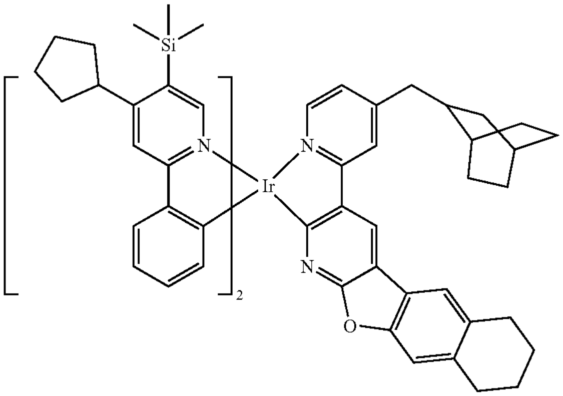
415
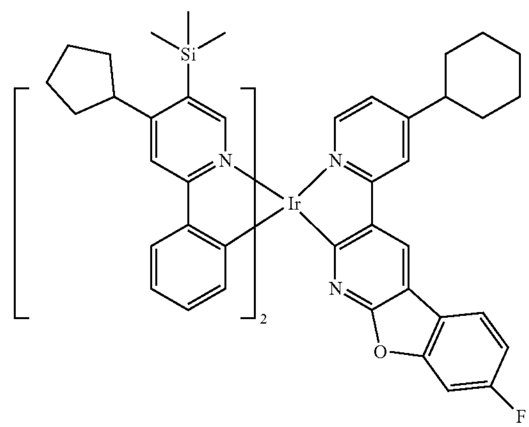
416
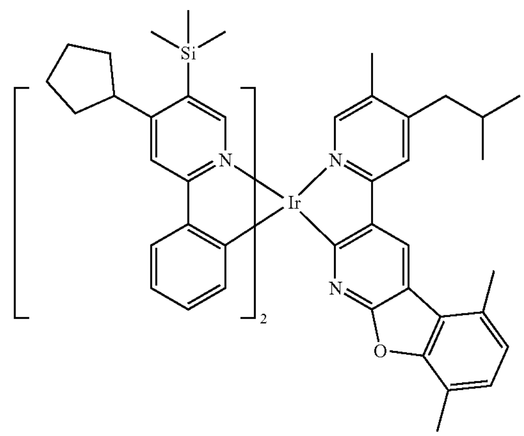

-continued
417
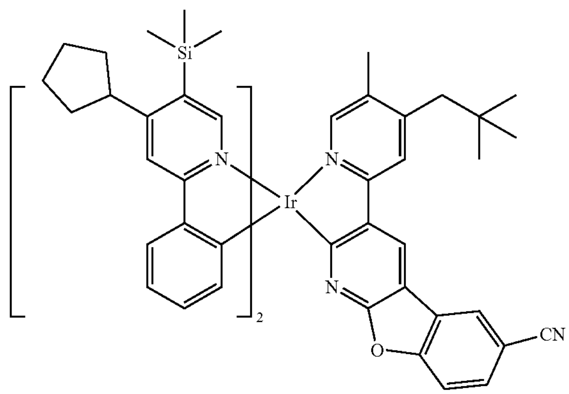
418
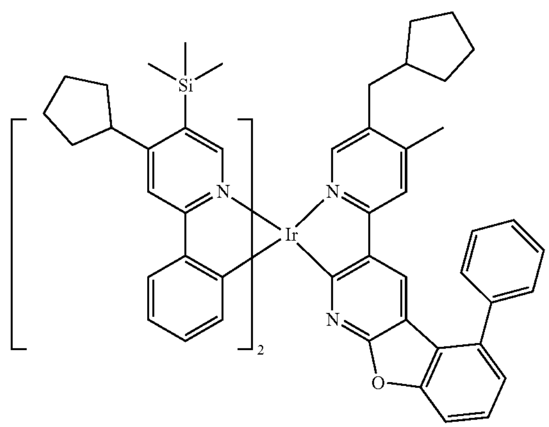
419
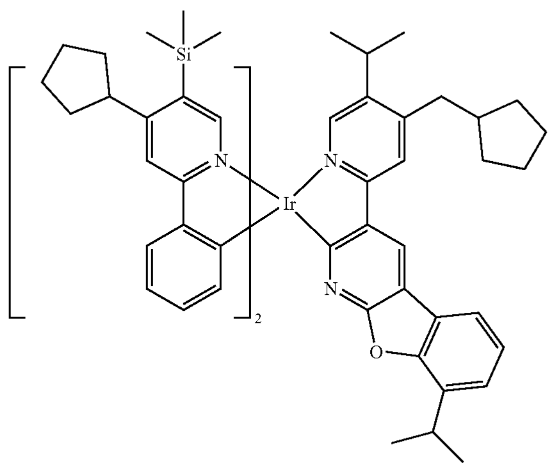
-continued
420
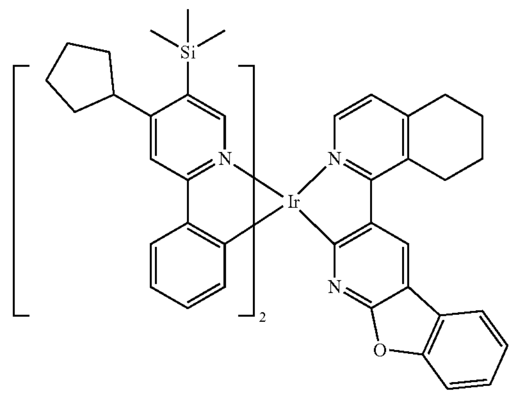
421
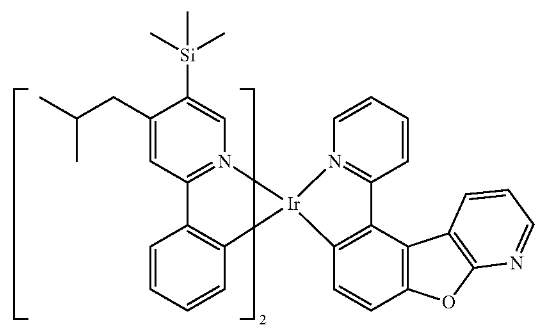
422
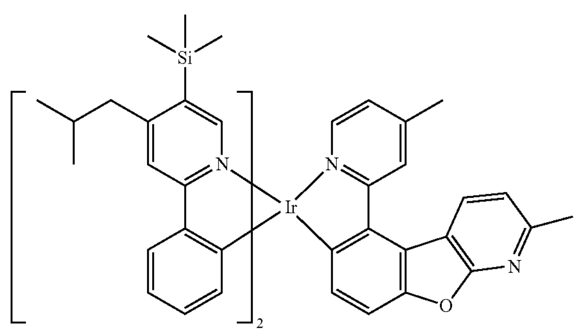
423
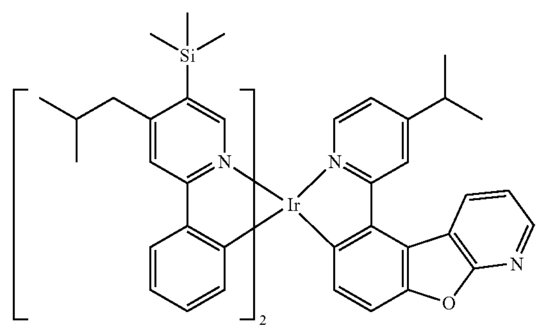

-continued
424
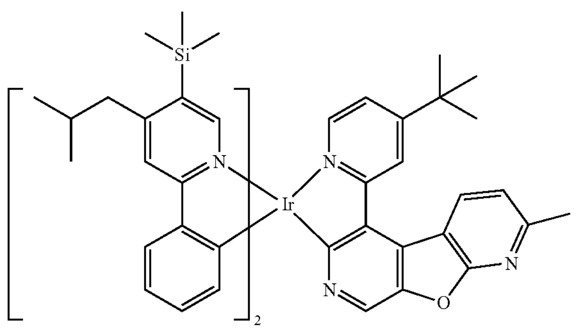
425
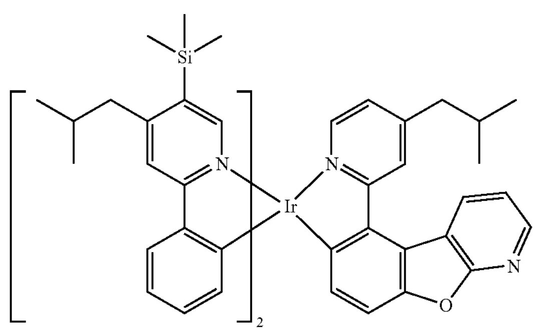
426
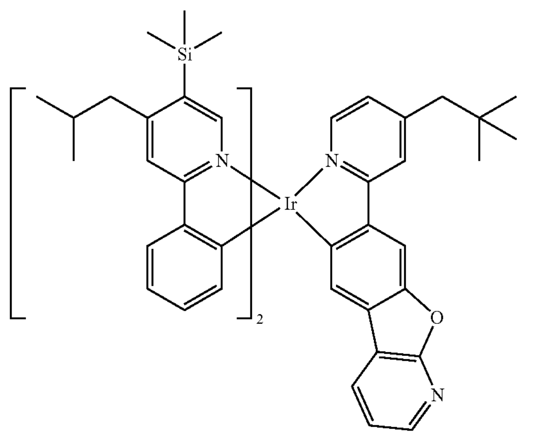
427
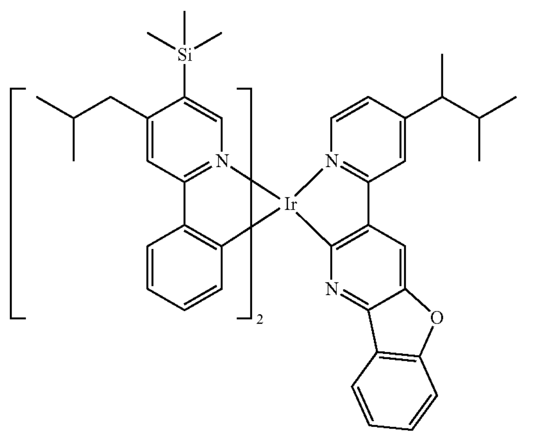
-continued
428
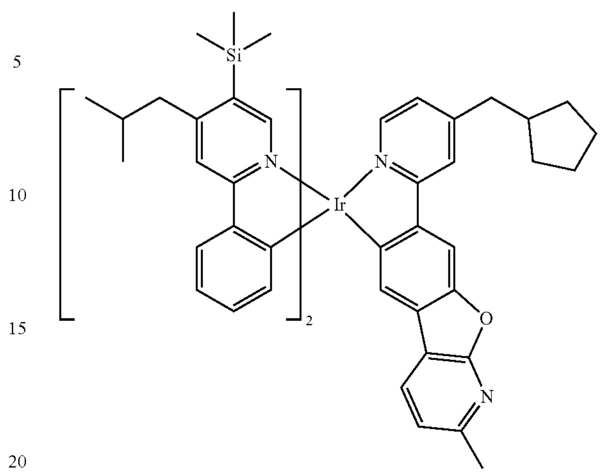
429
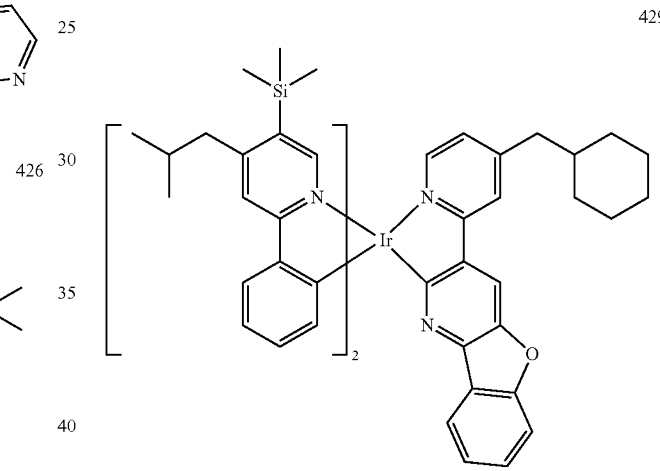
430
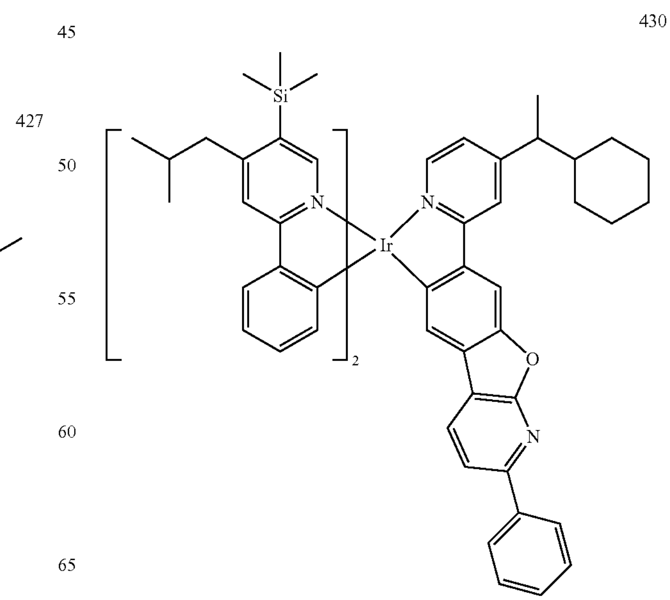

-continued
431
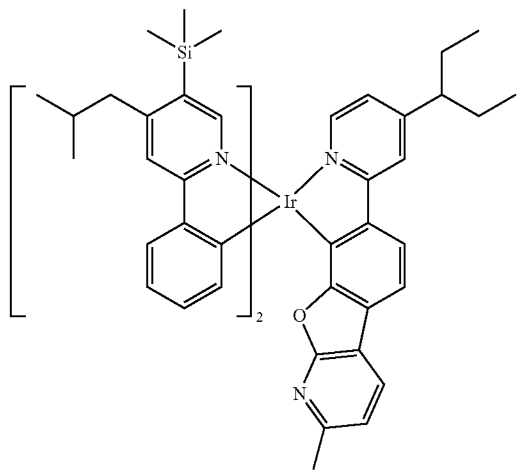
432
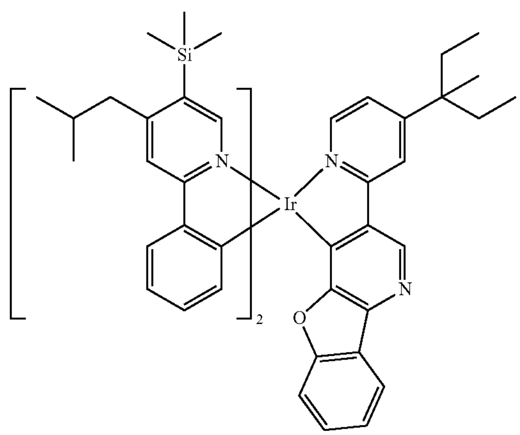
433
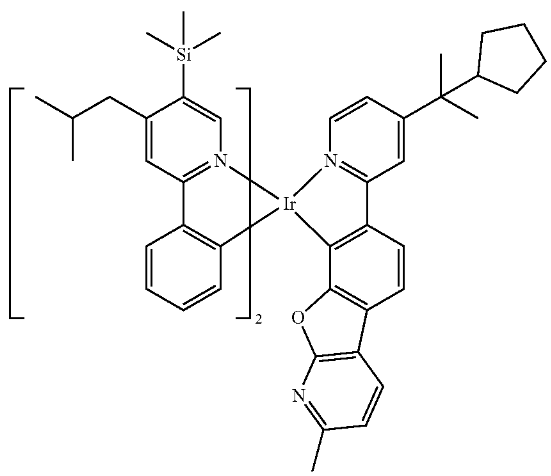
-continued
434
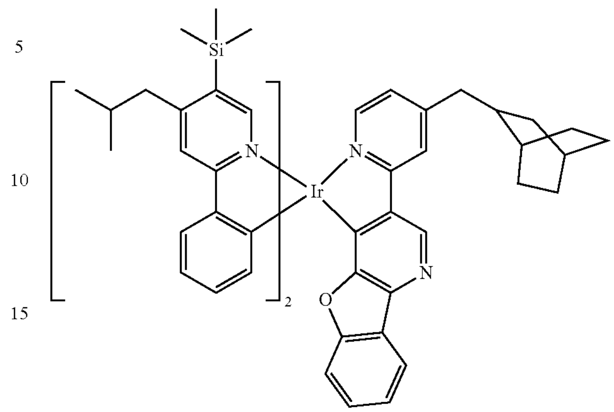
435
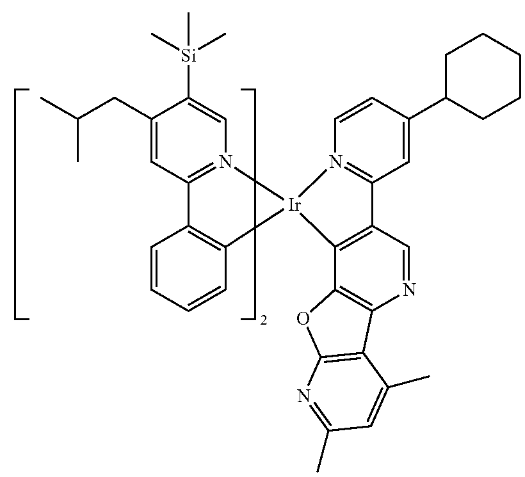
436
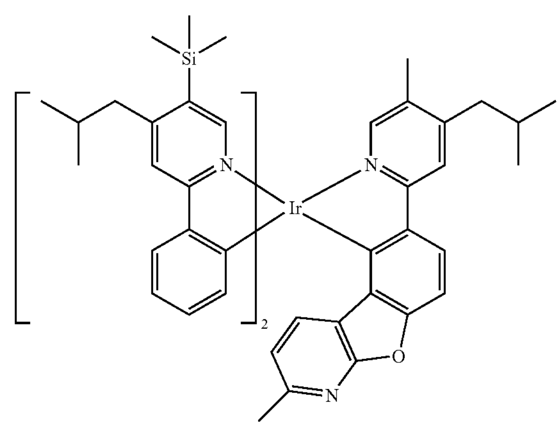

-continued
437
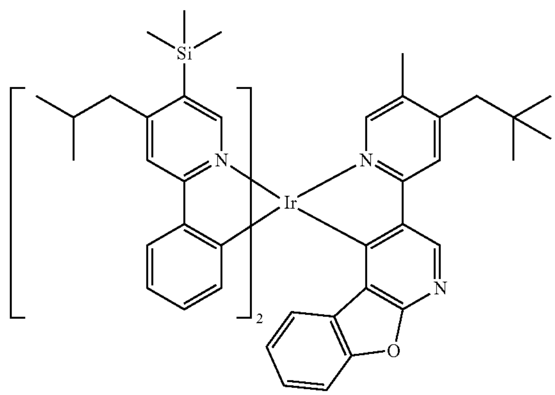
438
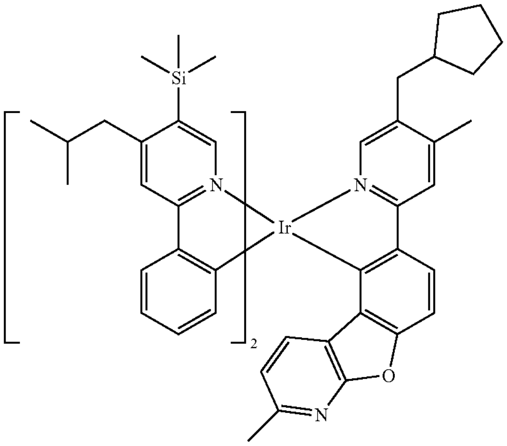
439
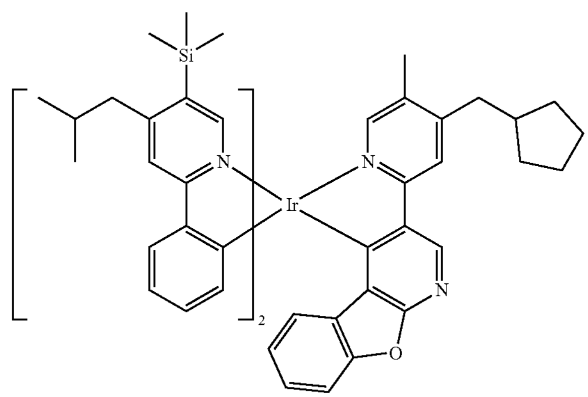
-continued
440
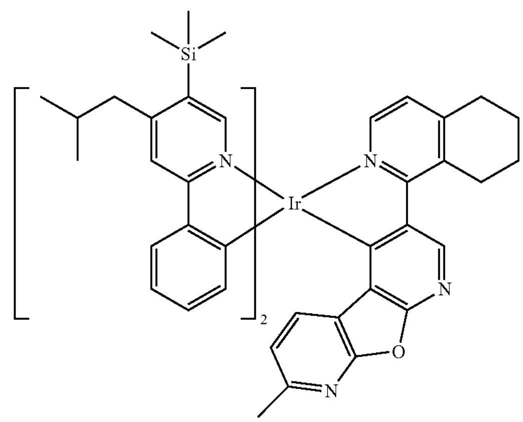
441
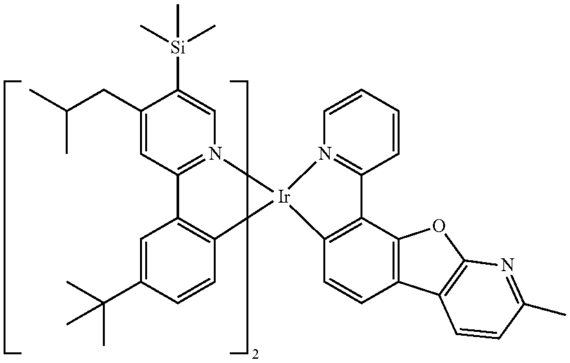
442
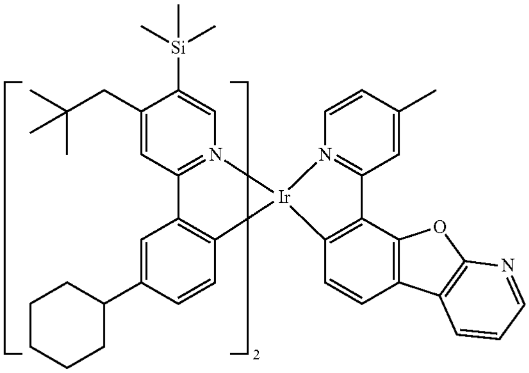
443
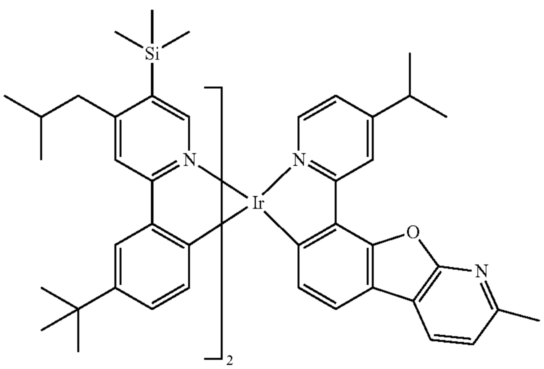

-continued
444
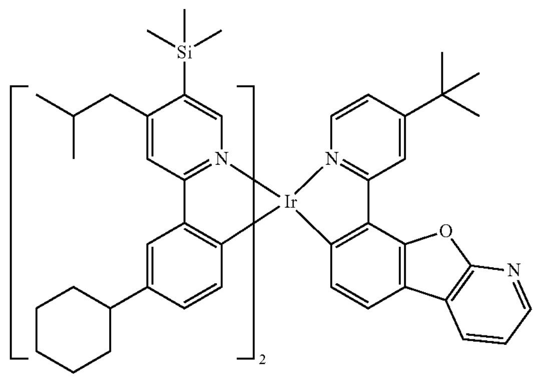
445
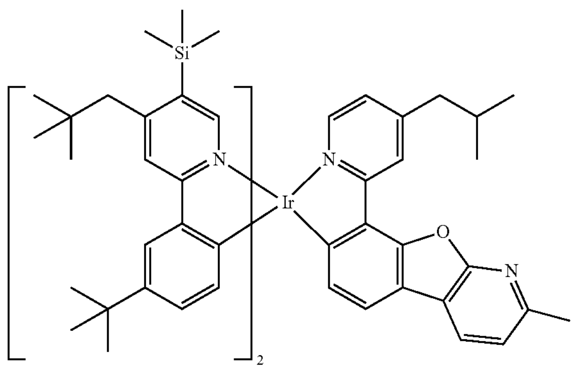
446
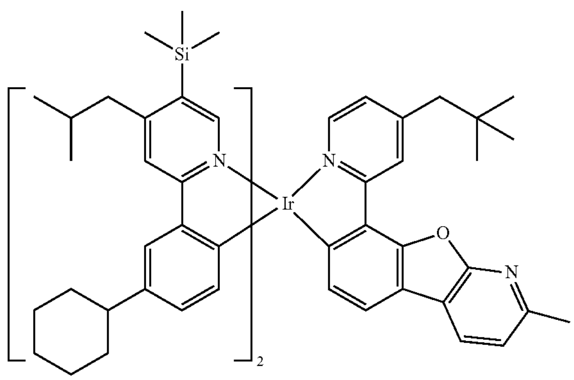
447
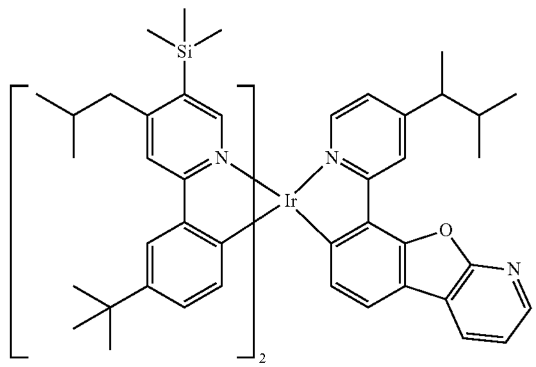
-continued
448
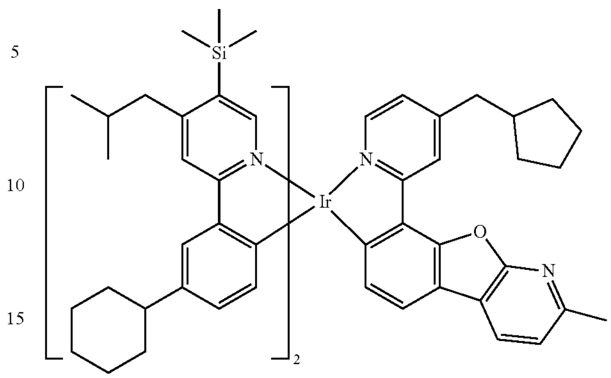
449
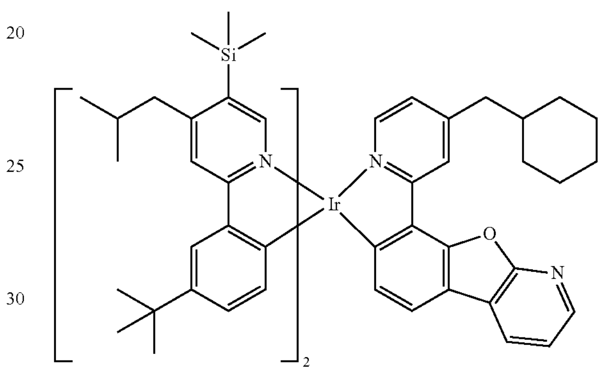
450
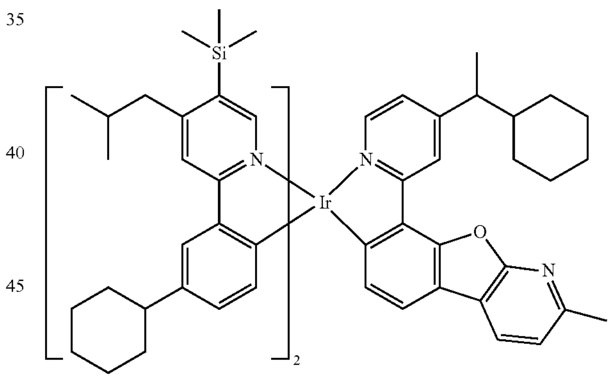
451
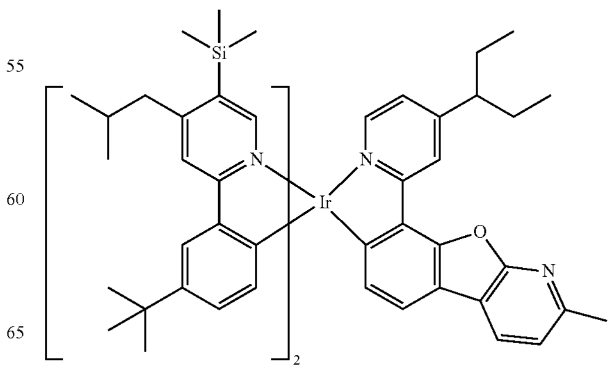

-continued
452
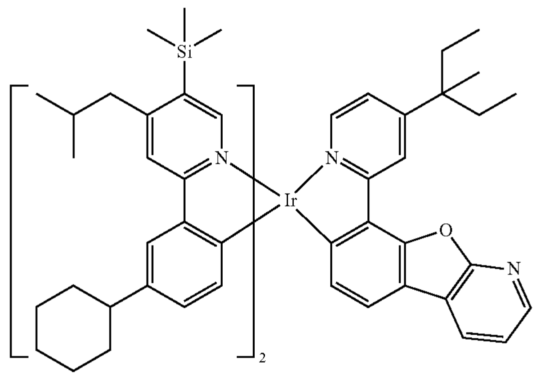
453
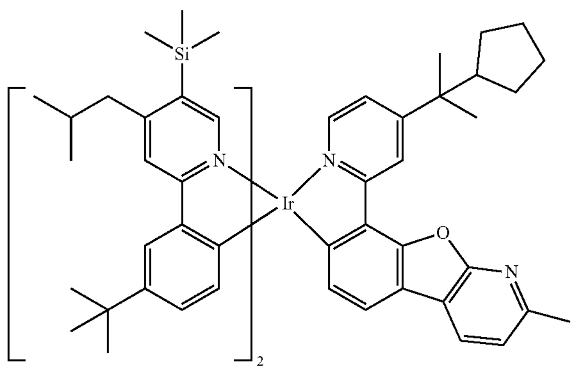
454
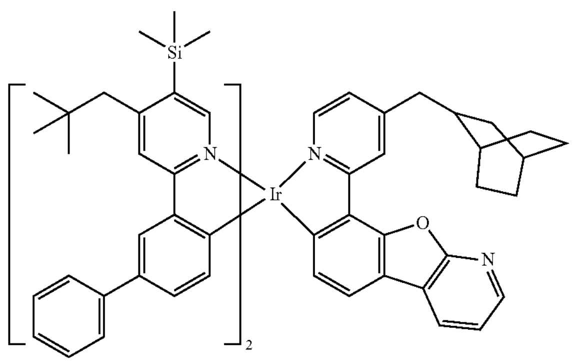
455
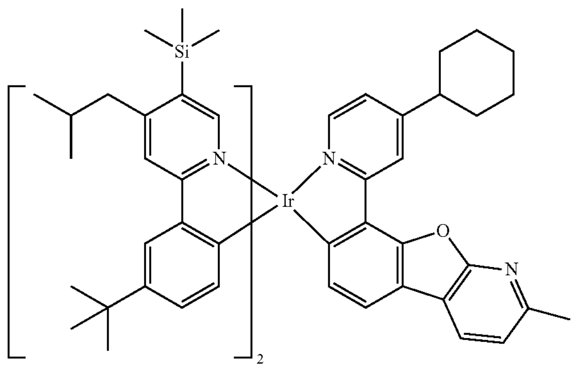
-continued
456
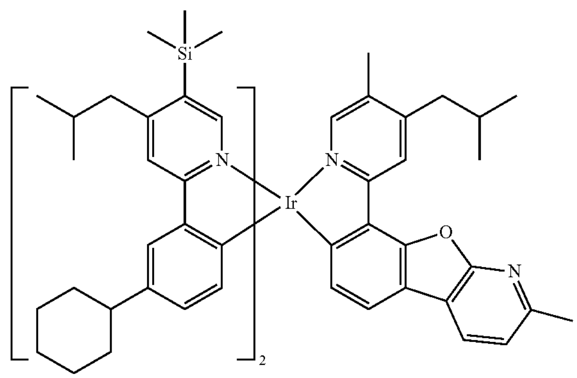
457
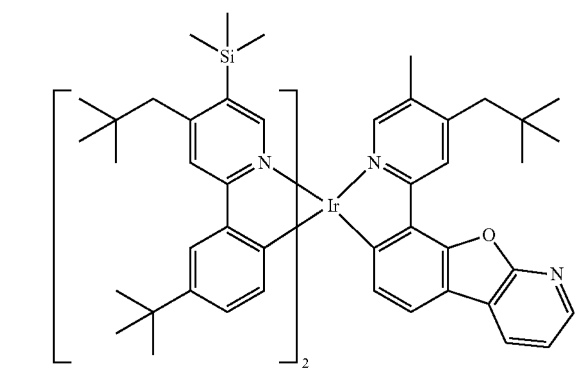
458
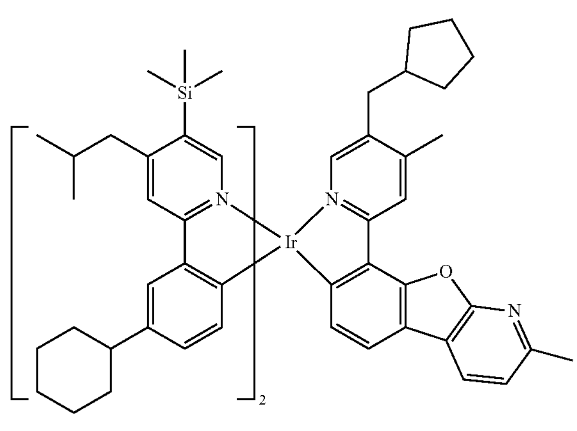
459
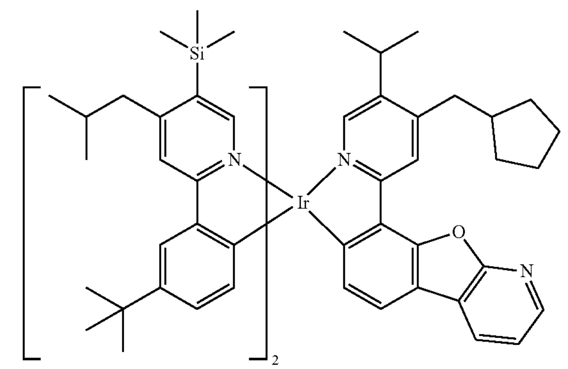

-continued
460
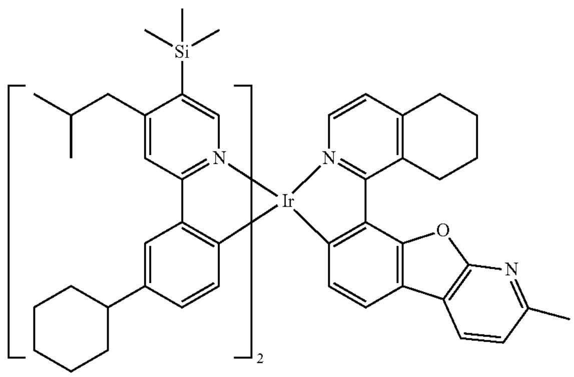
461
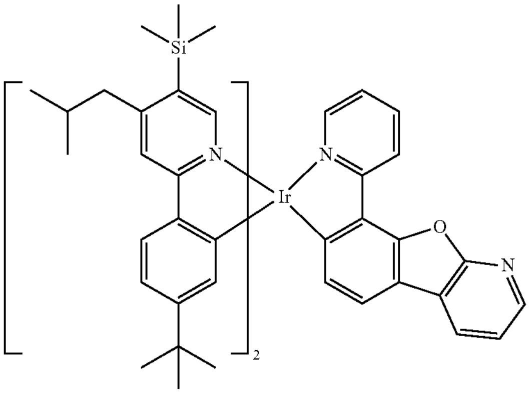
462
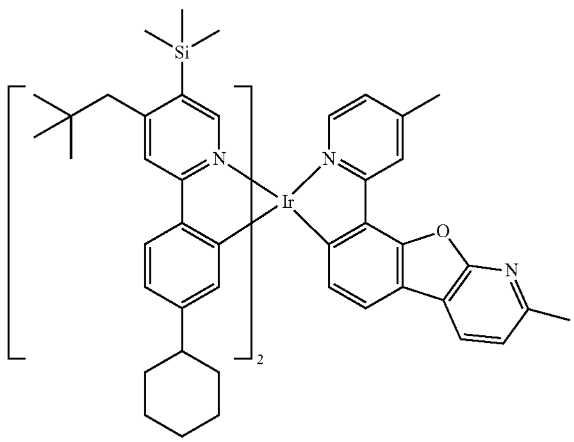
-continued
463
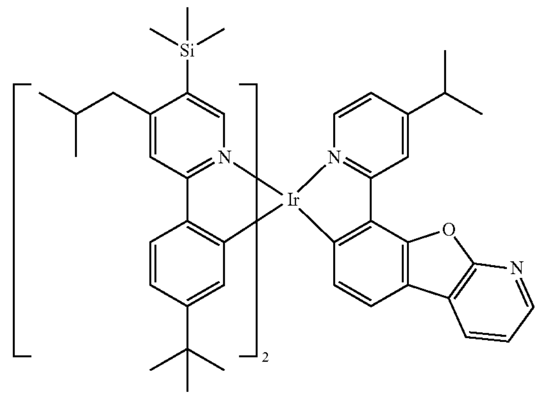
464
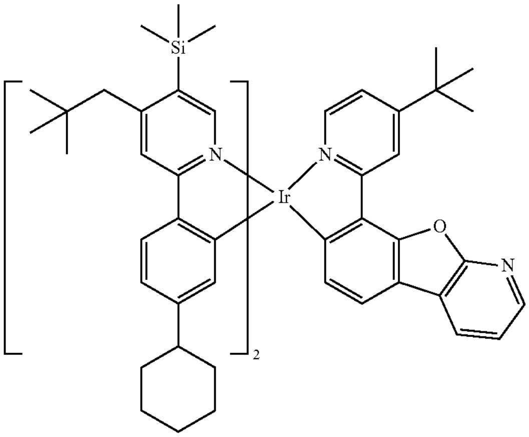
465
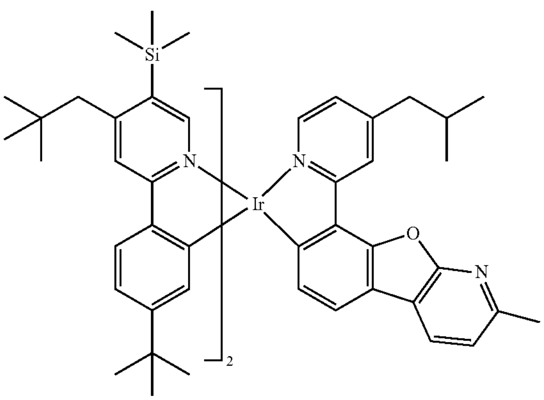

-continued
466
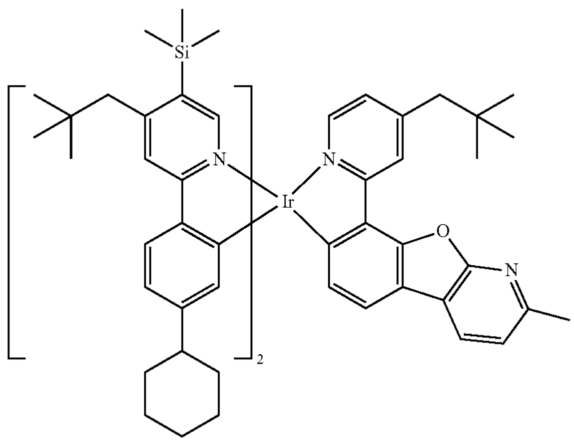
467
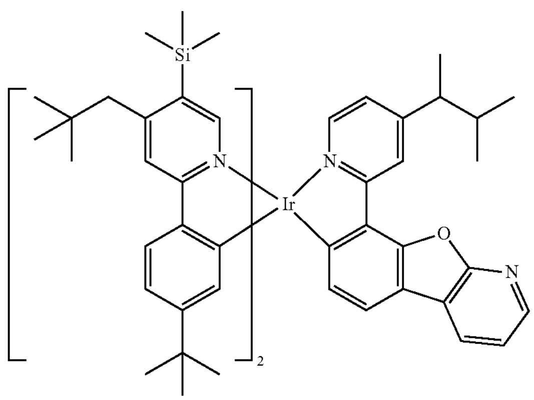
468
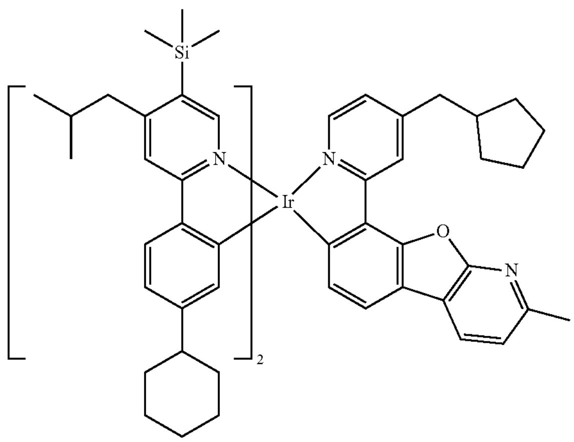
-continued
469
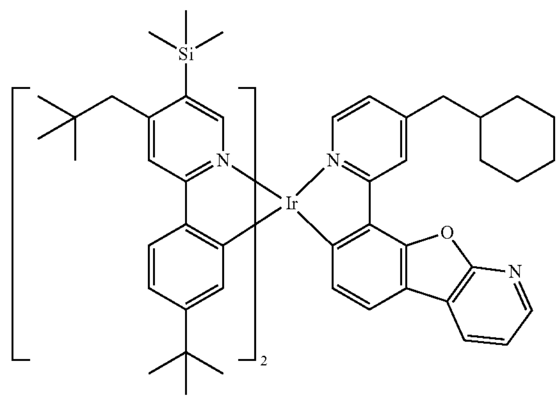
470
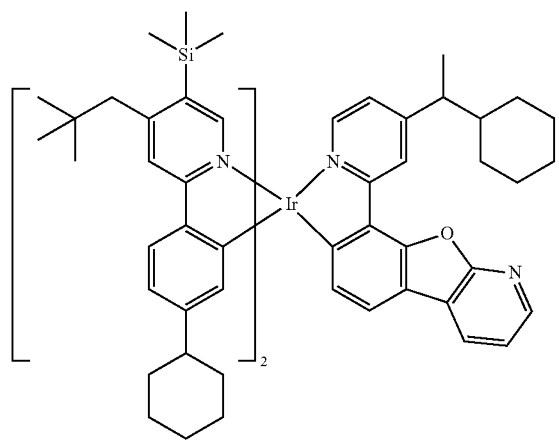
471
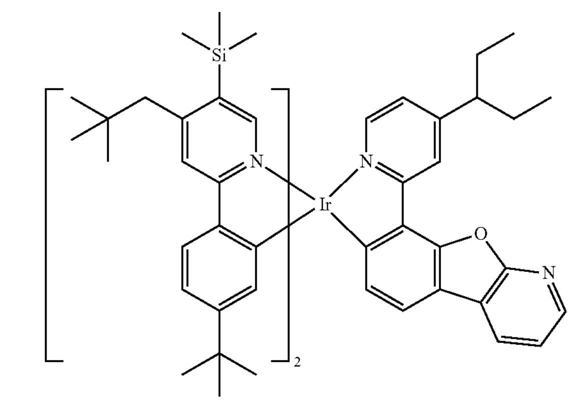

472
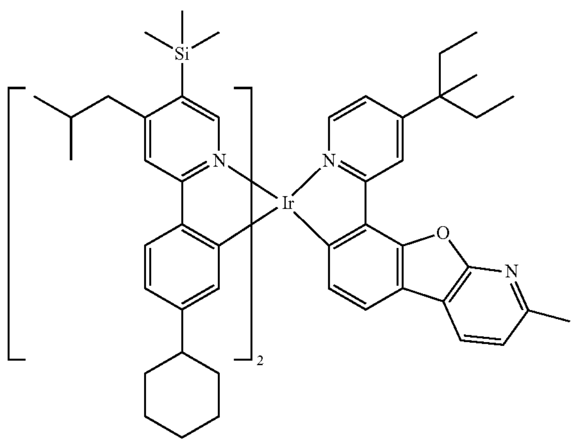
473
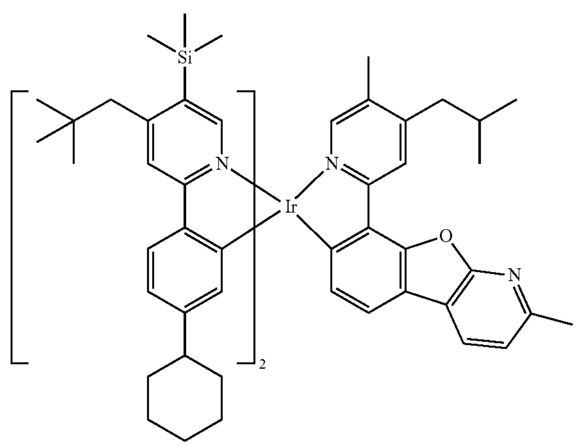
474
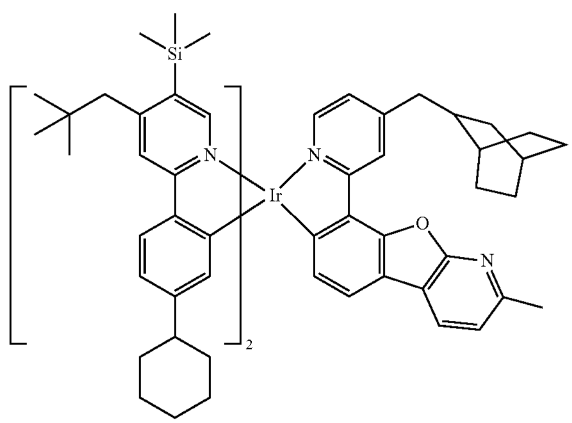
475
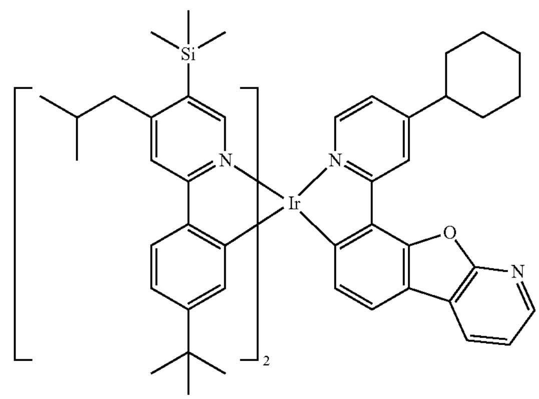
476
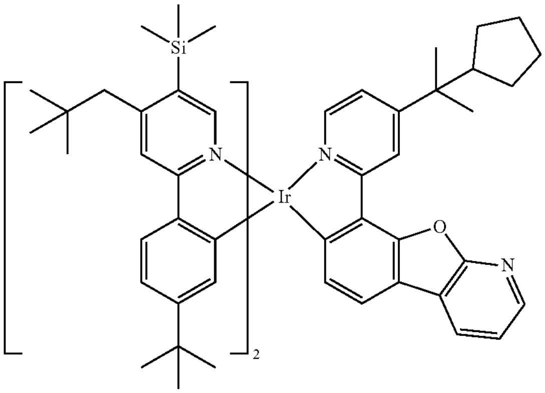
477
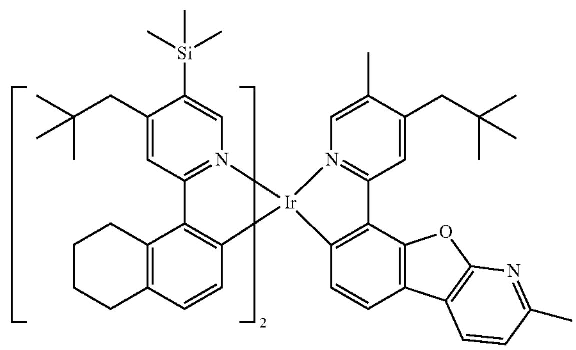

-continued
478 
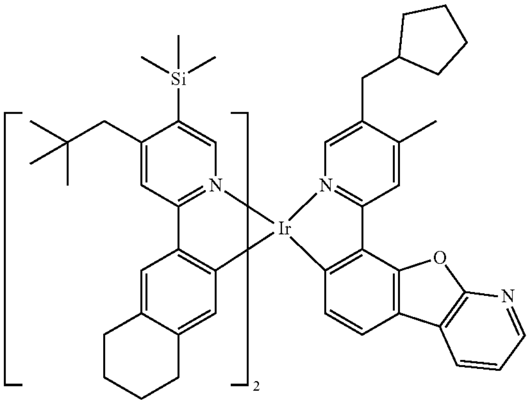
479 
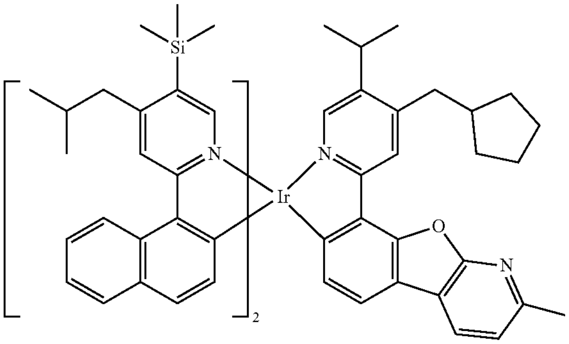
480 
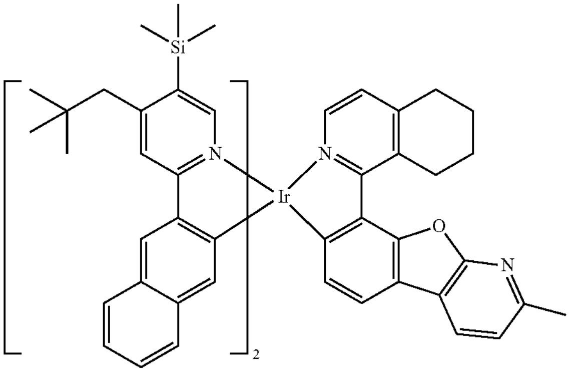
481 
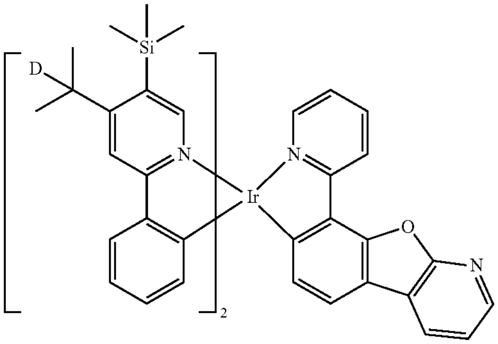
-continued
482 
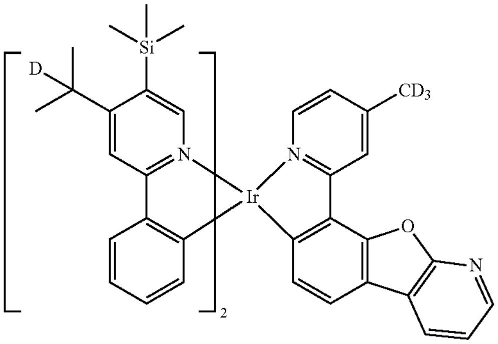
483 
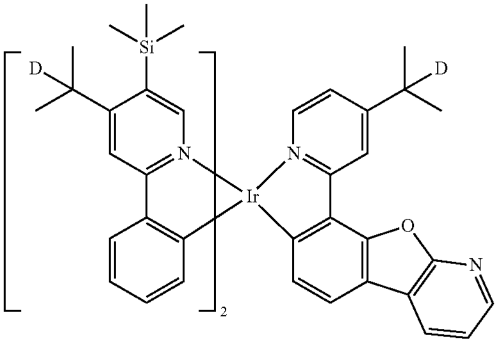
484 
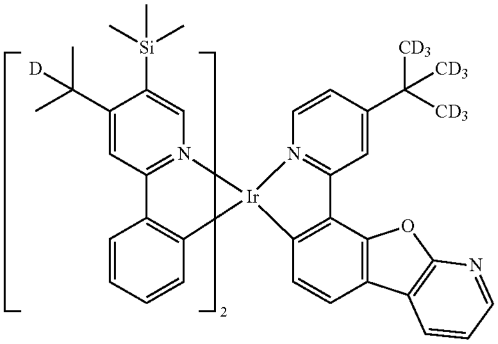
485 
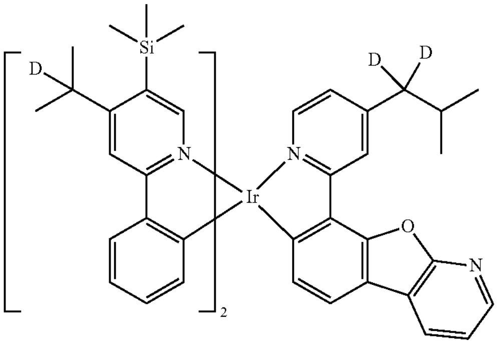

-continued
486
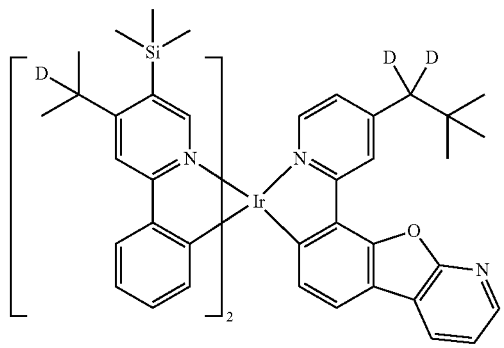
487
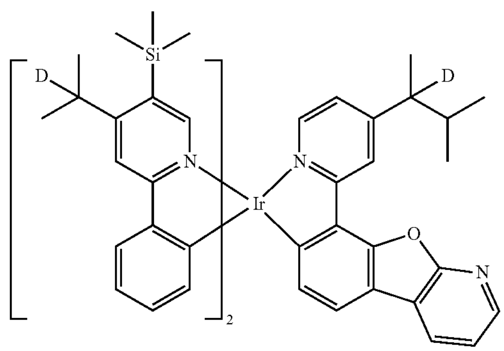
488
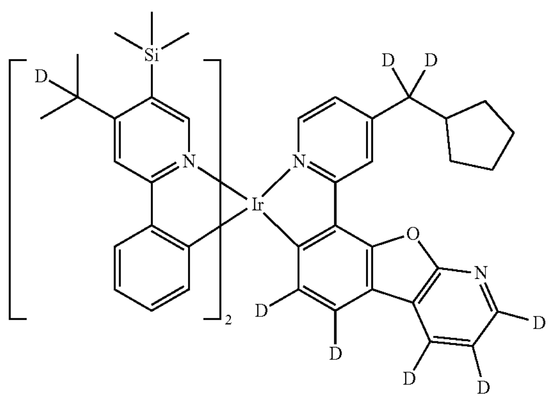
489
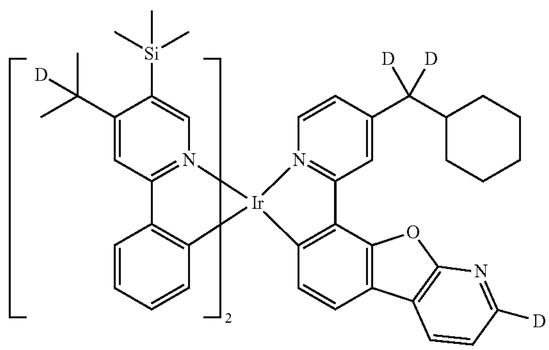
-continued
490
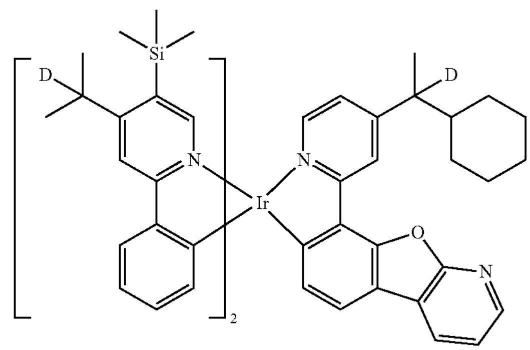
491
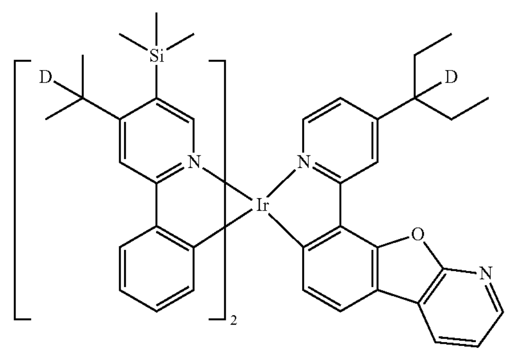
492
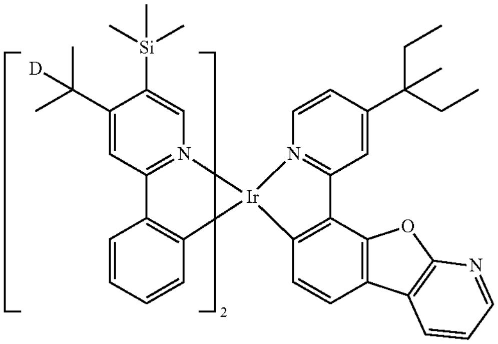
493
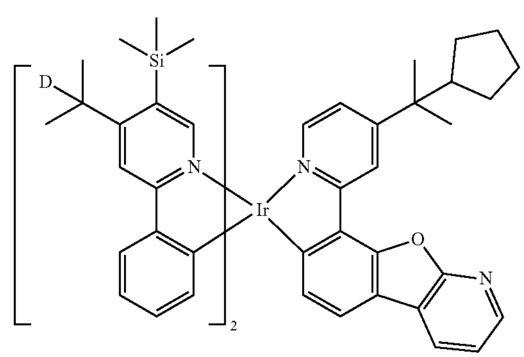

-continued
494
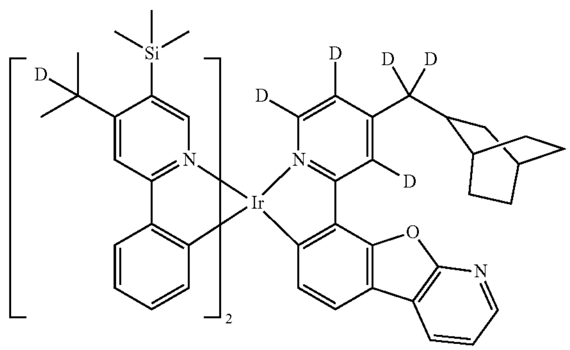
495
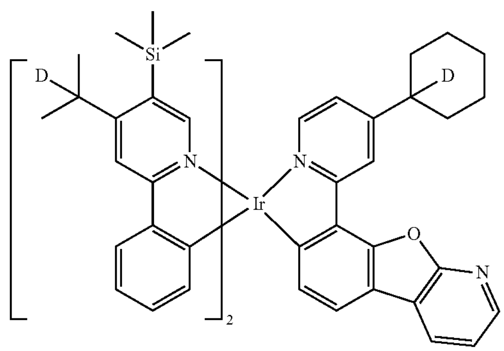
496
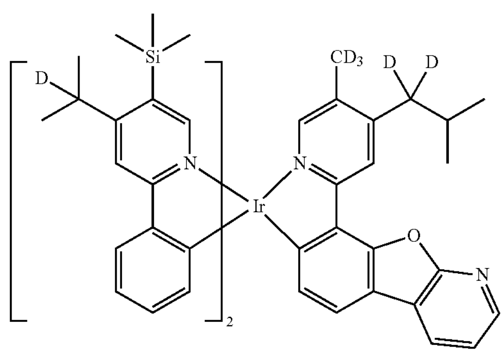
497
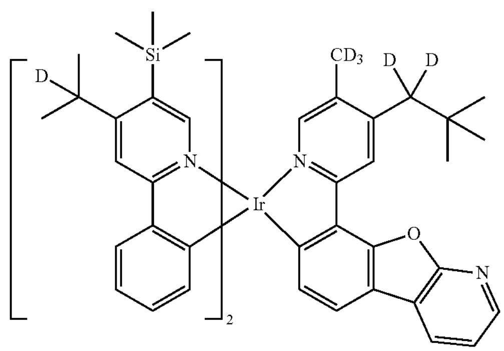
-continued
498
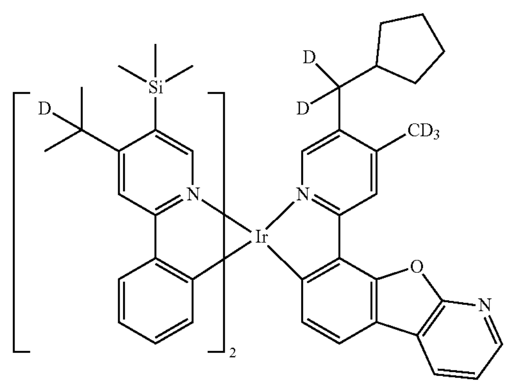
499
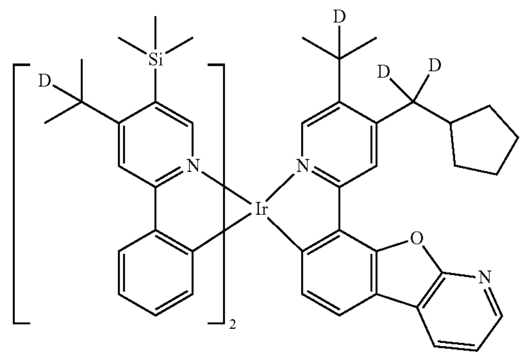
500
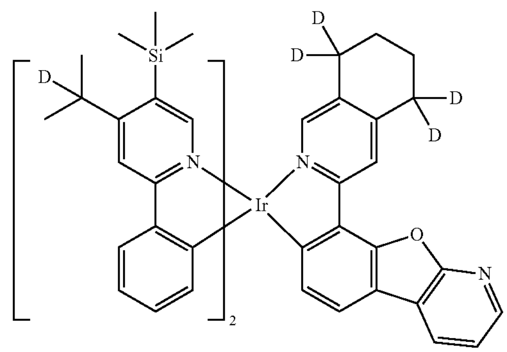
501
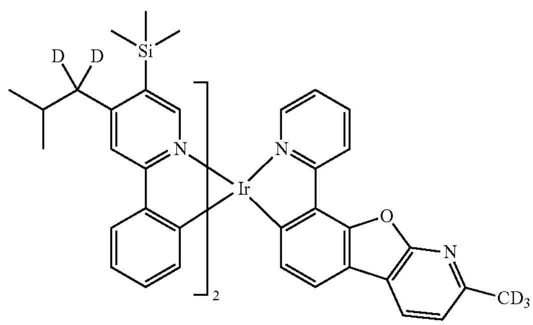

-continued
502
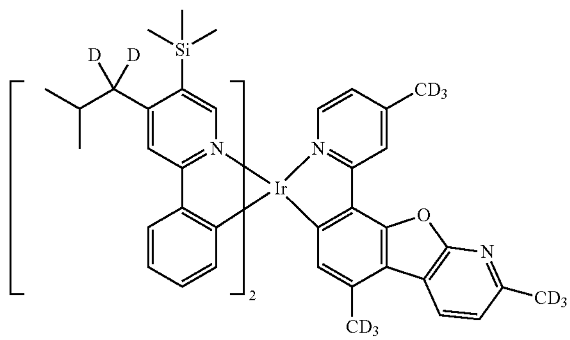
503
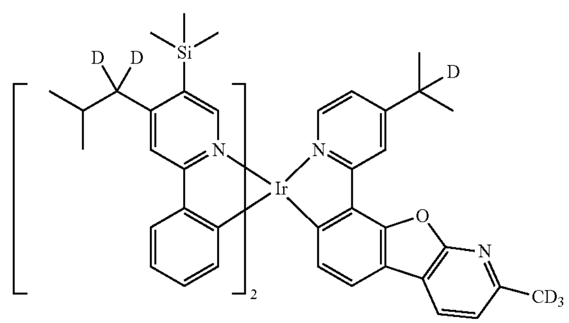
504
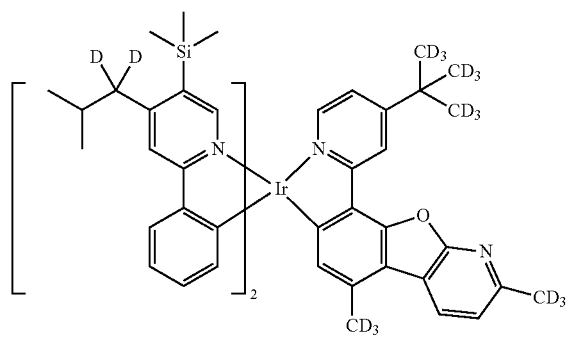
505
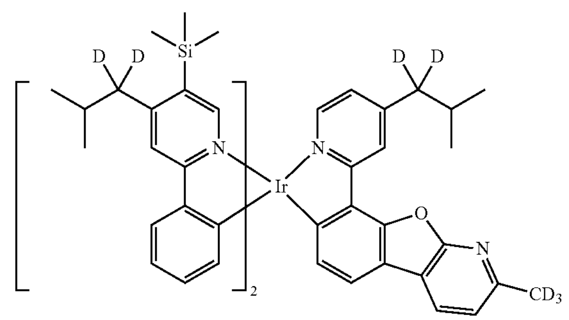
-continued
506
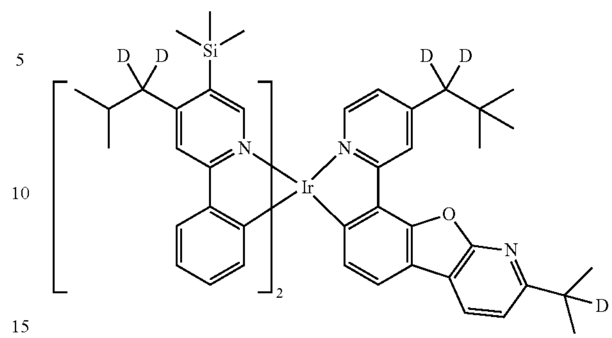
507
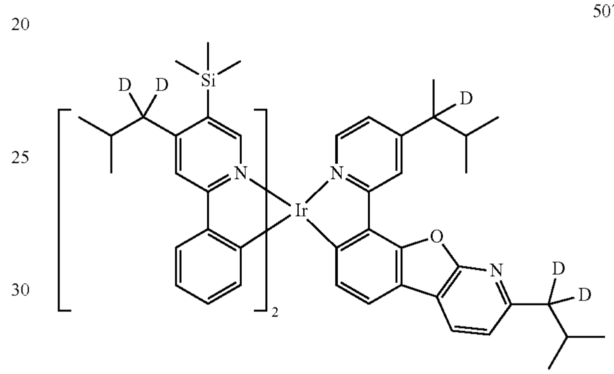
508
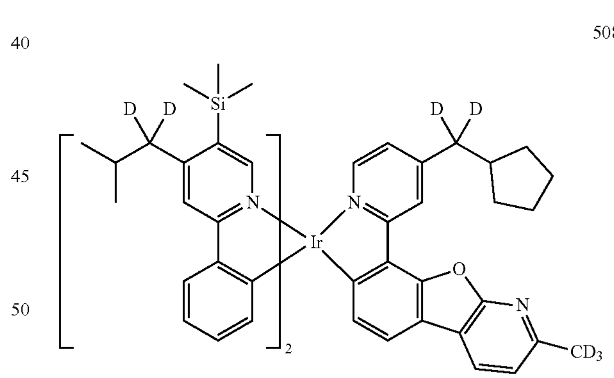
509
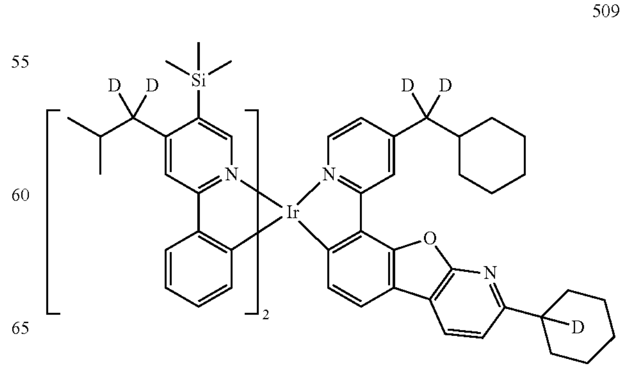

-continued
510
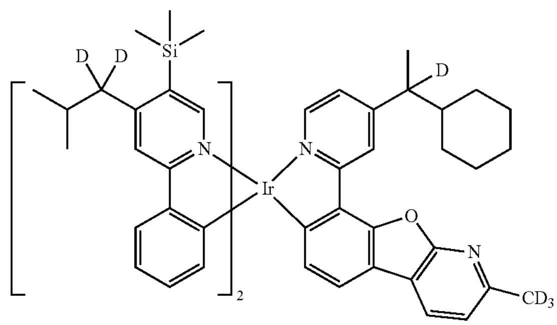
511
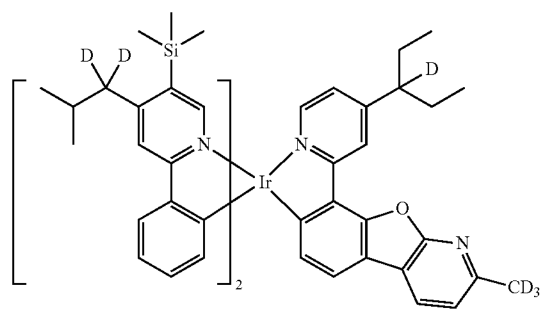
512
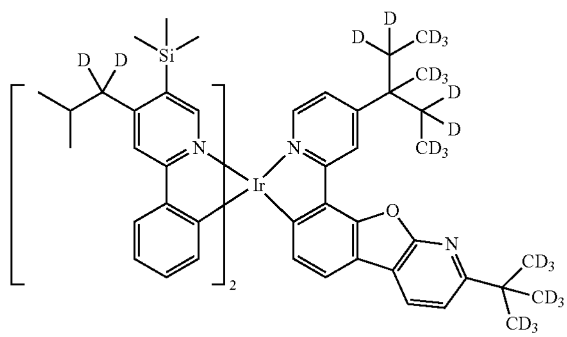
513
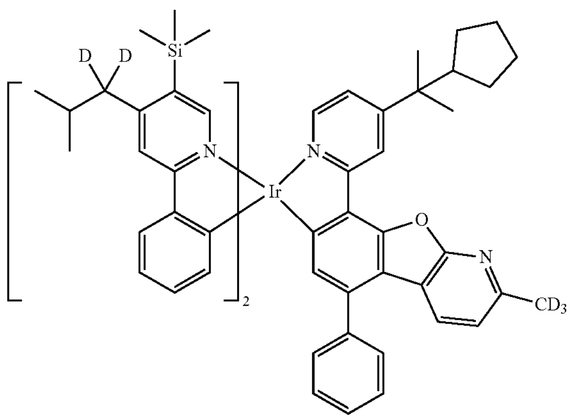
-continued
514
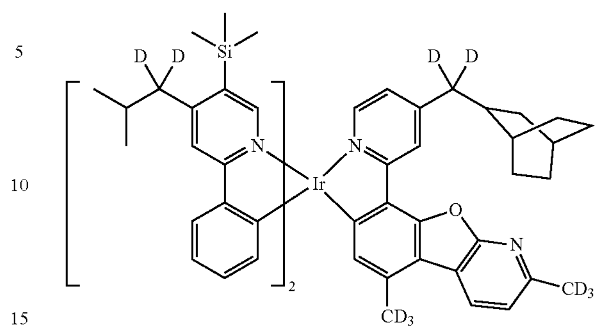
515
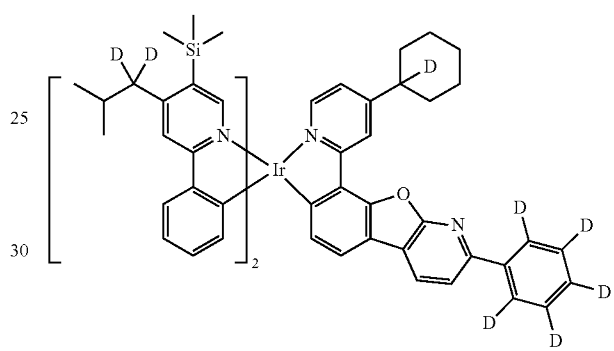
516
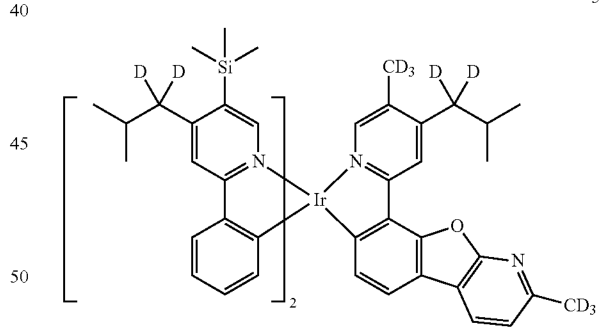
517
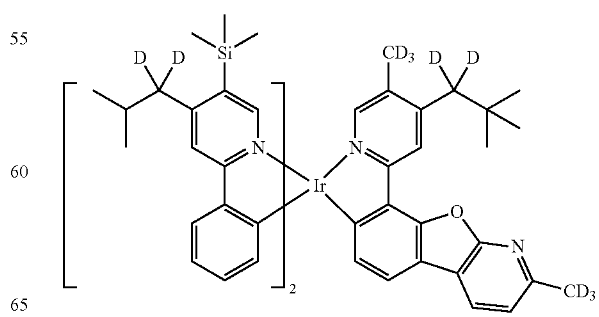

-continued
518
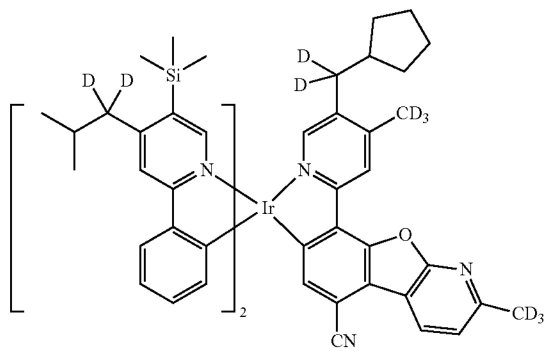
519
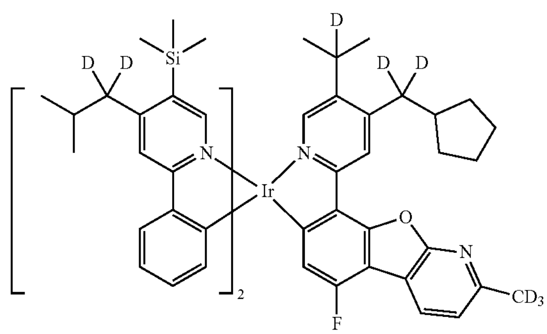
520
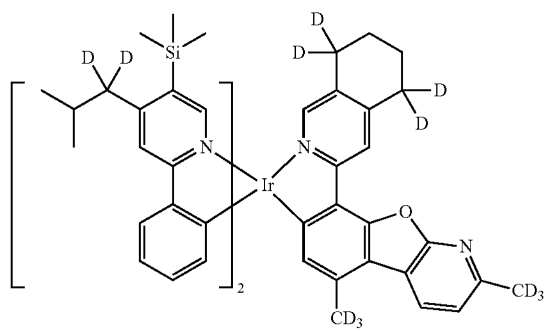
521
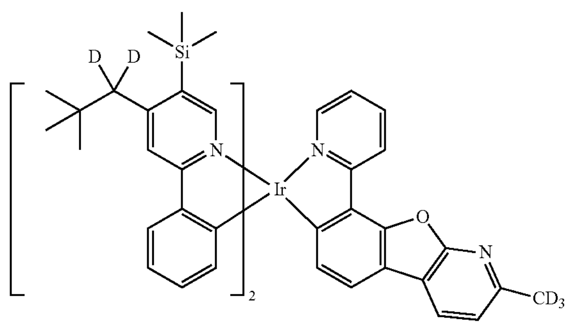
-continued
522
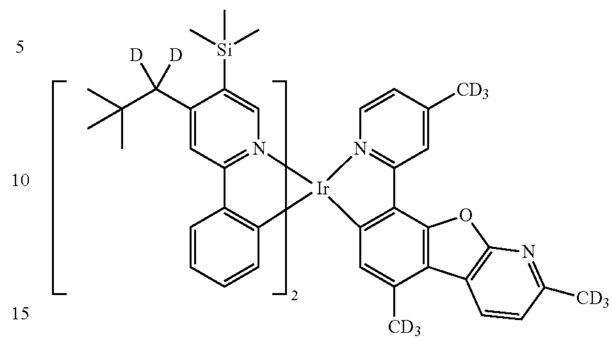
523
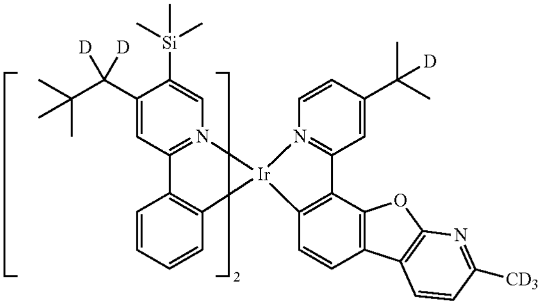
524
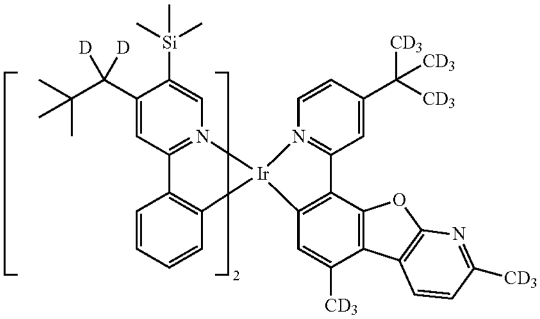
525
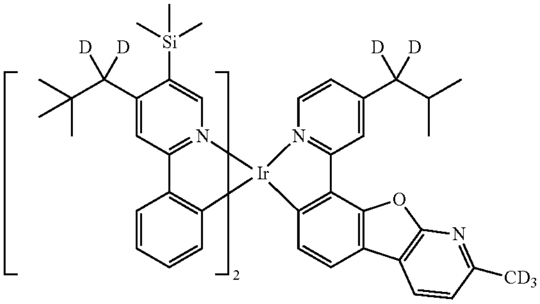

-continued
526
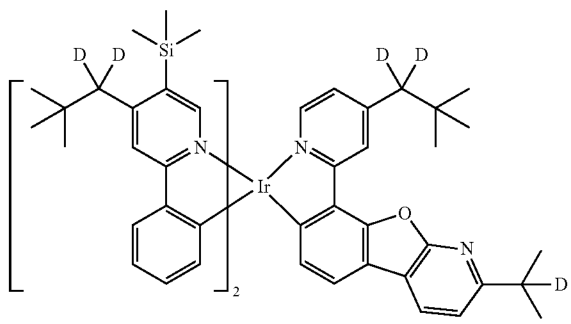
527
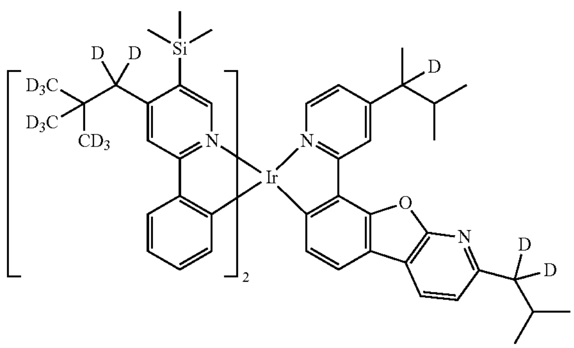
528
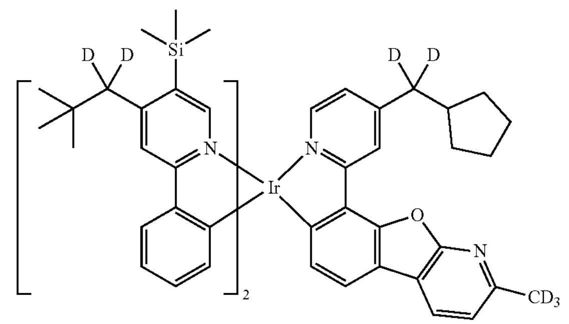
529
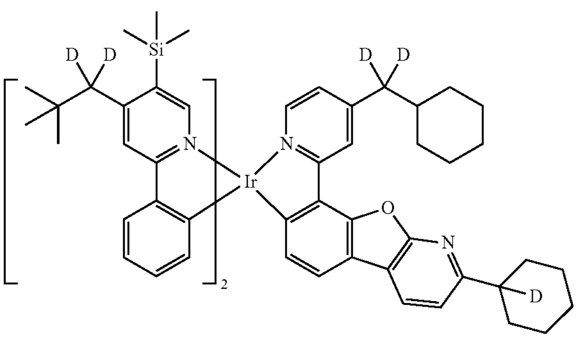
-continued
530
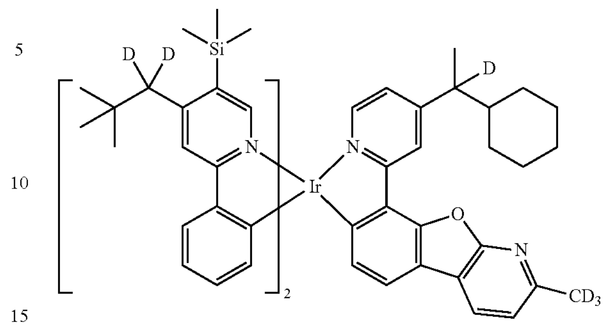
531
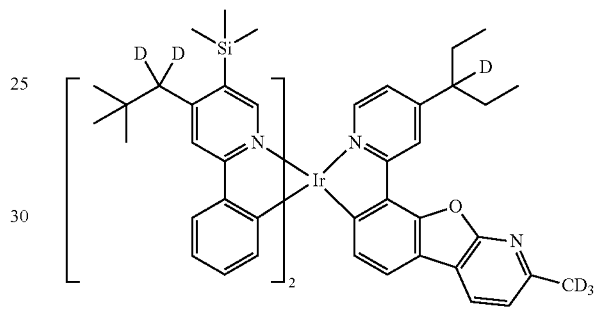
532
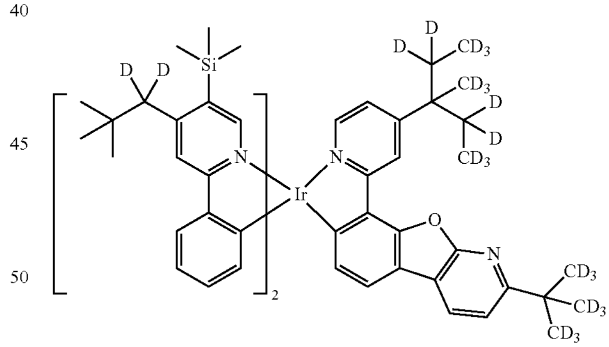
533
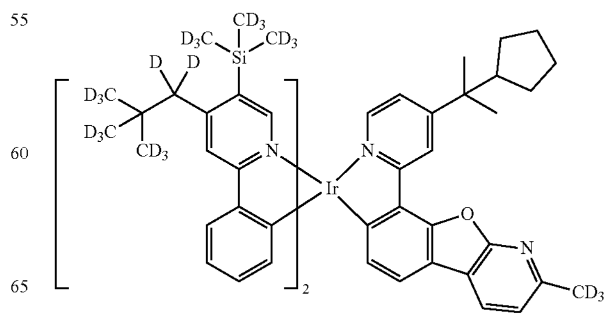

-continued
534
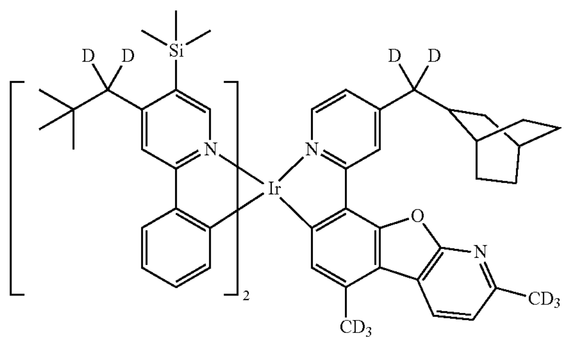
535
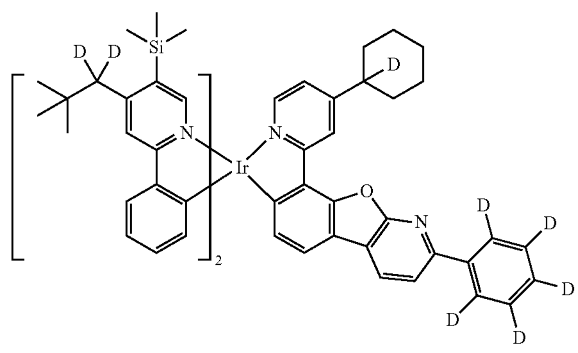
536
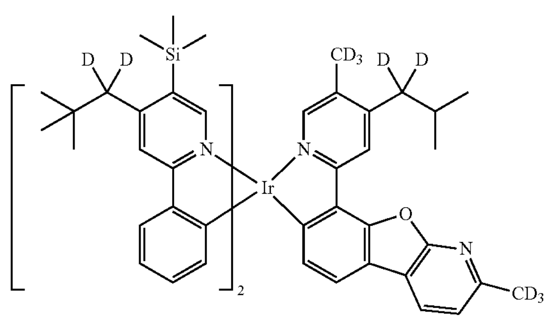
537
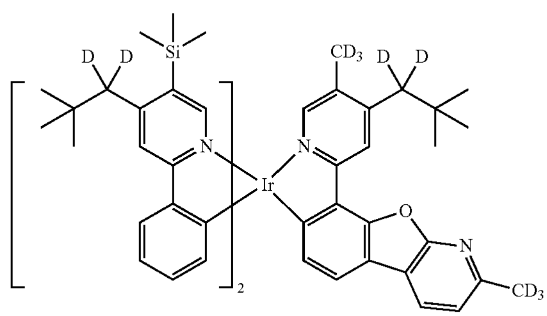
-continued
538
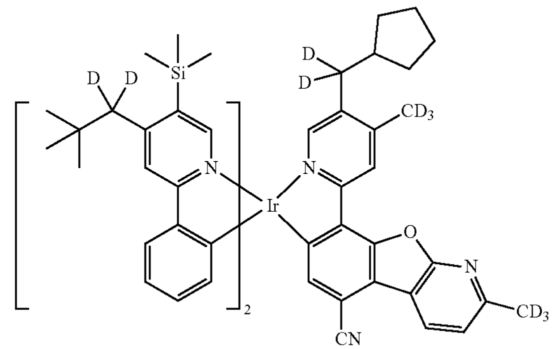
539
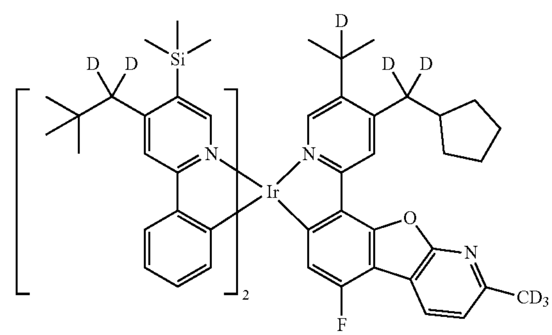
540
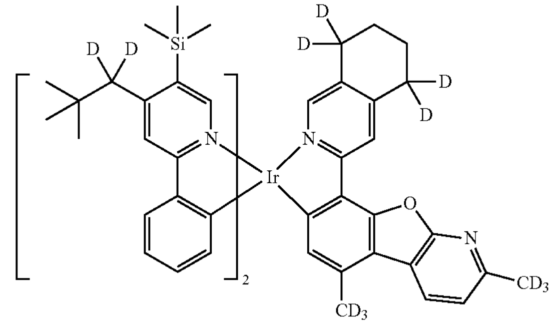
541
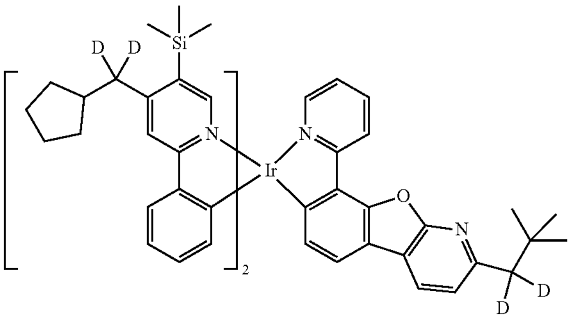

-continued
542
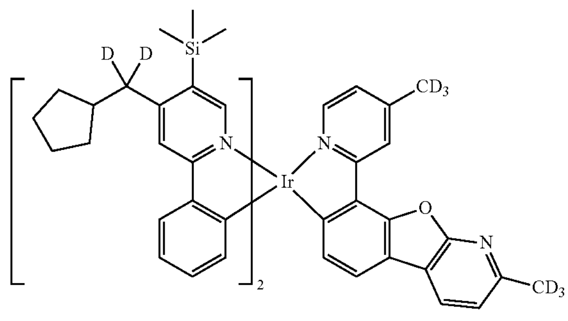
543
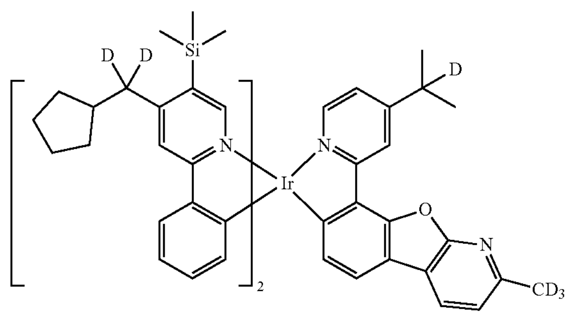
544
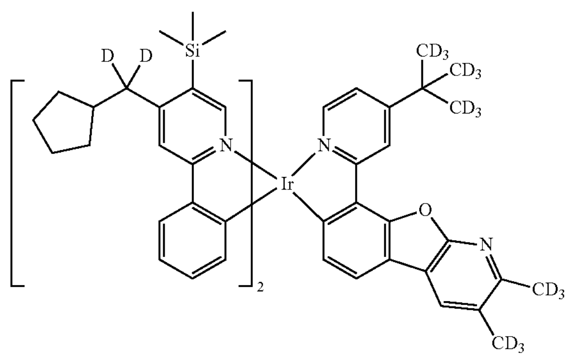
545
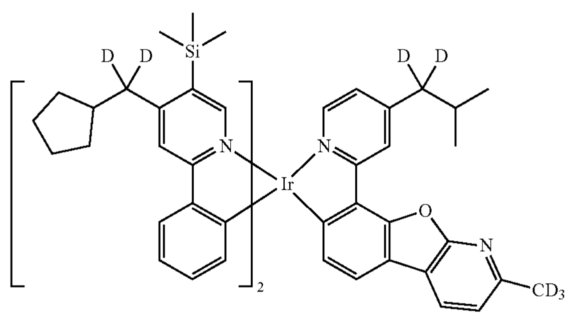
-continued
546
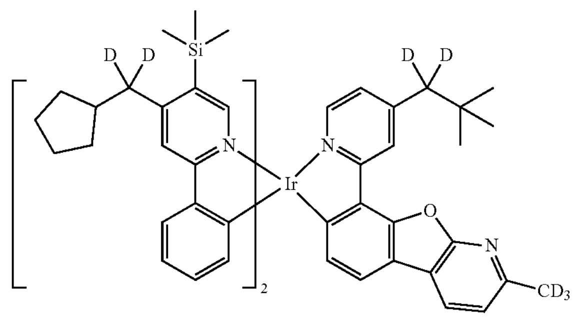
547
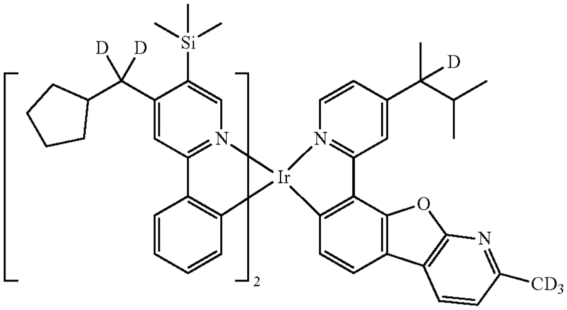
548
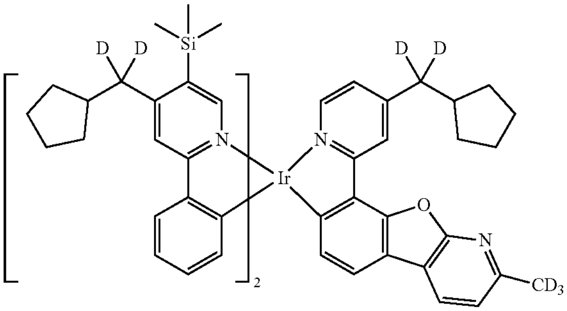
549
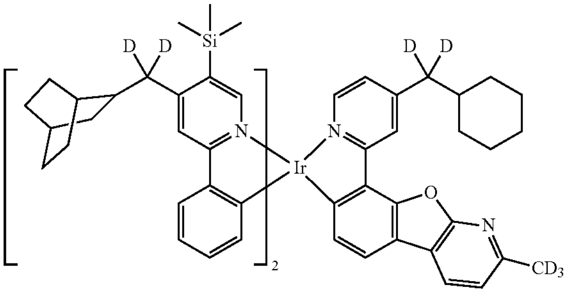

-continued
550
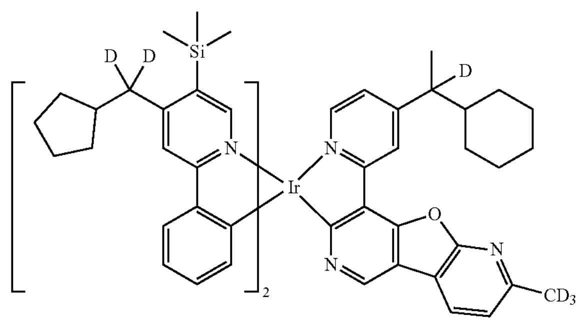
551
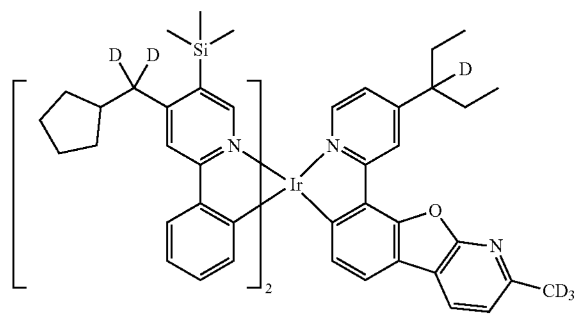
552
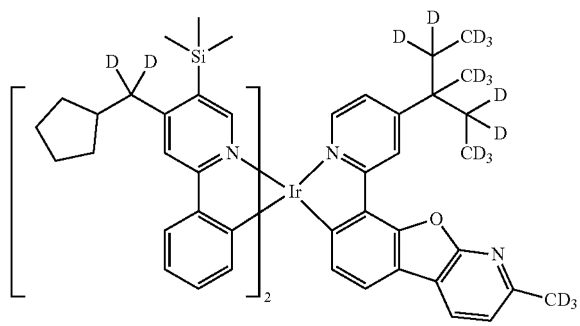
553
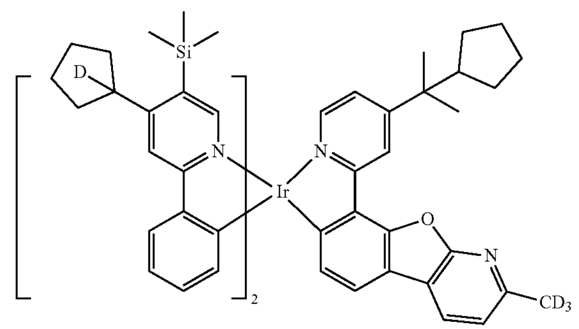
-continued
554
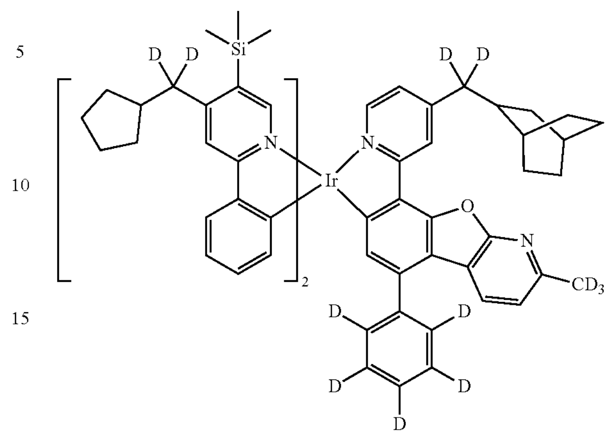
555
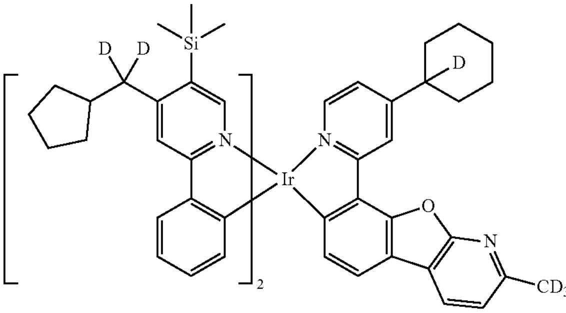
556
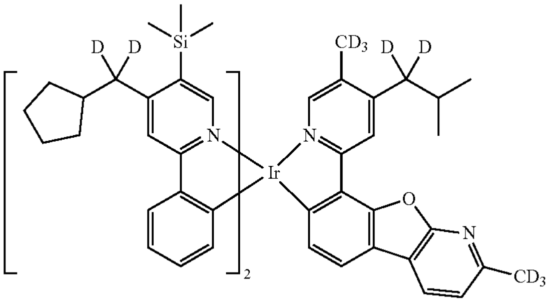
557
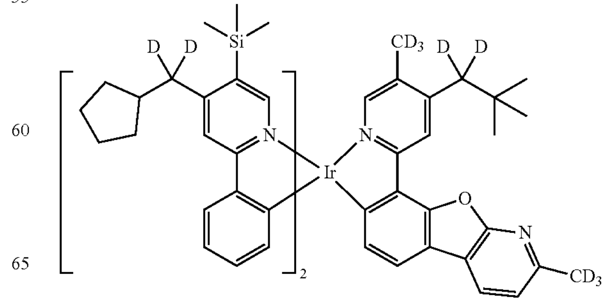

-continued
558
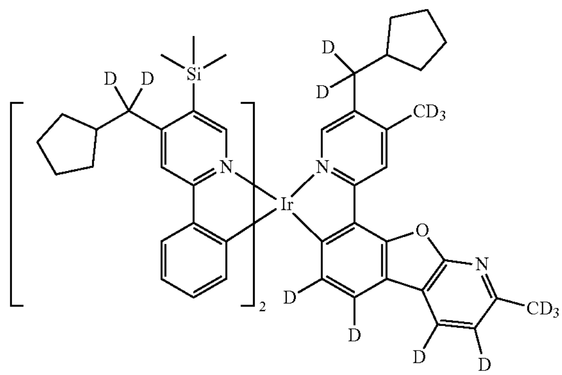
559
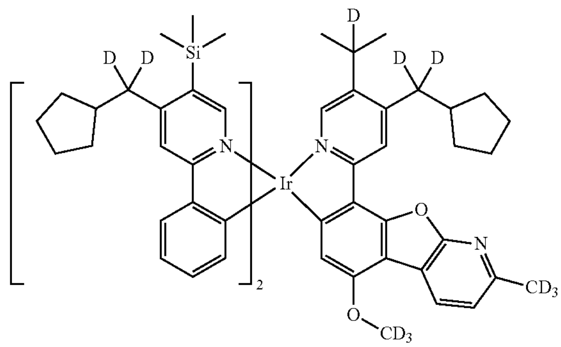
560
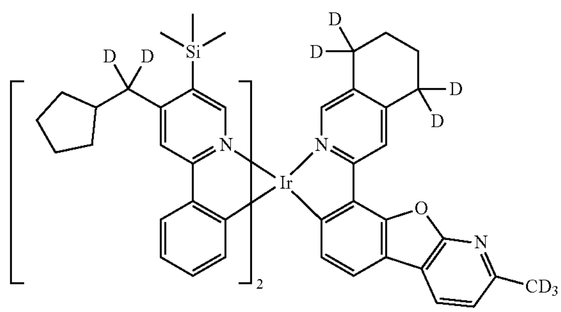
561
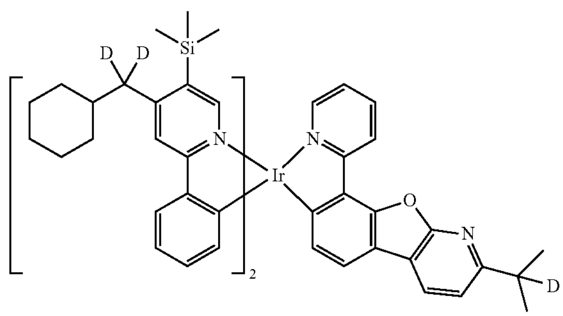
-continued
562
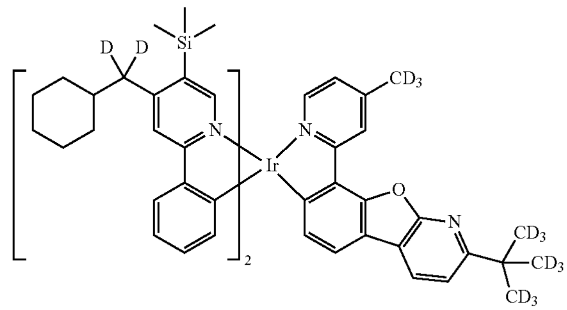
563
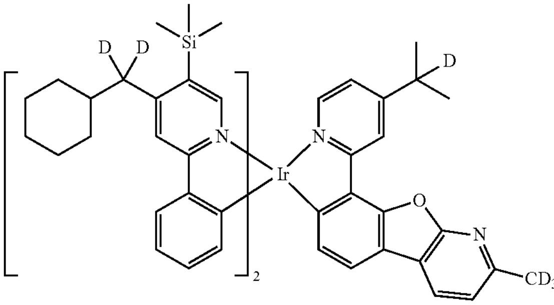
564
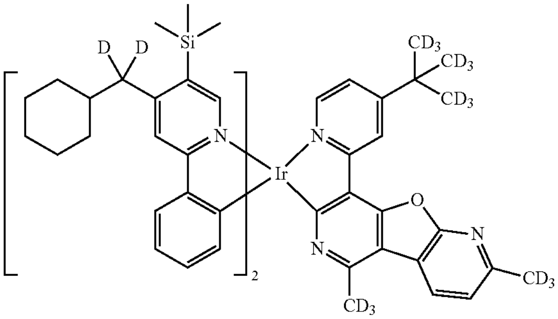
565
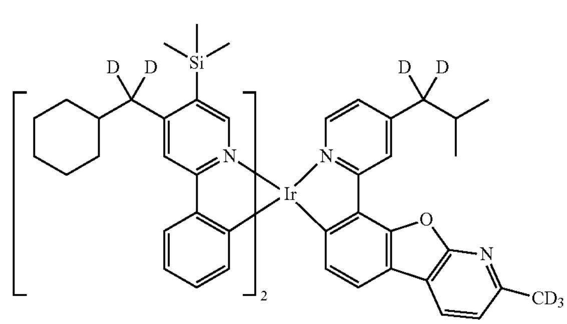

566
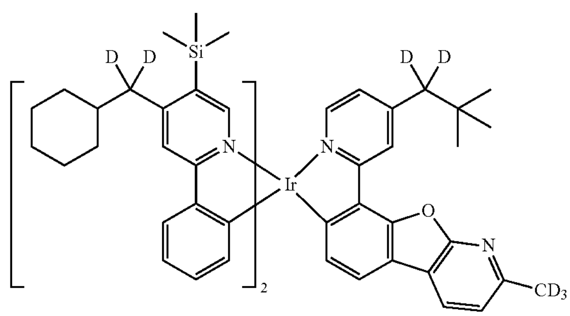
567
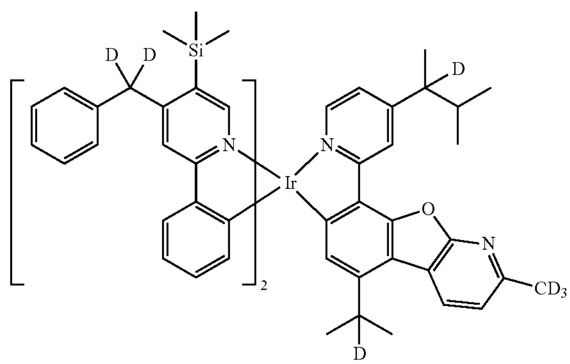
568
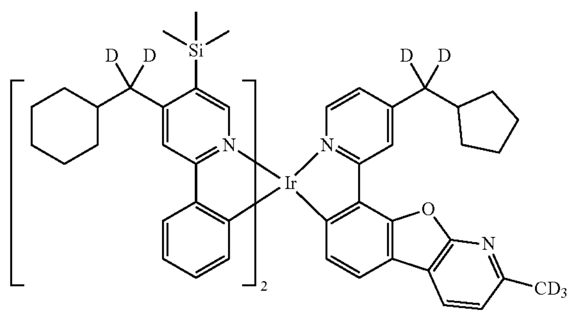
569
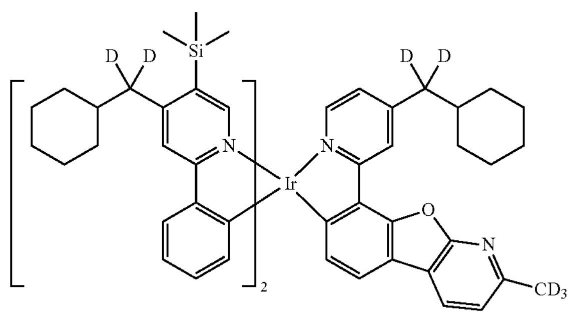
570
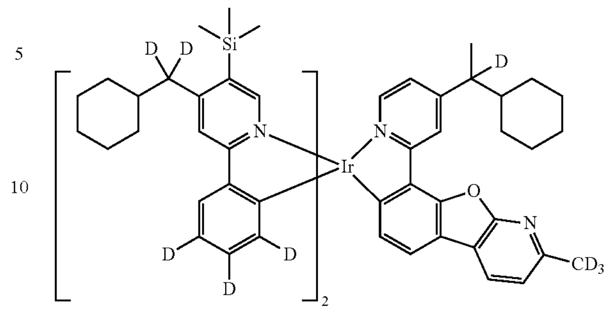
571
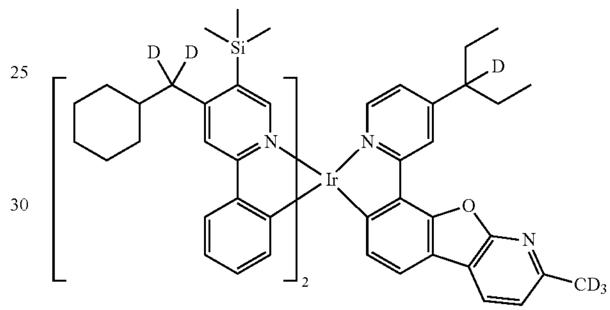
572
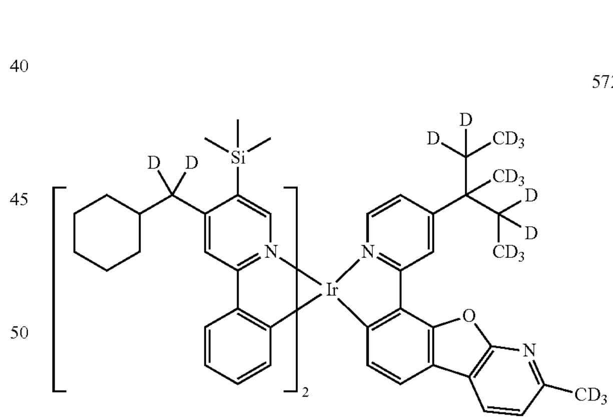
573
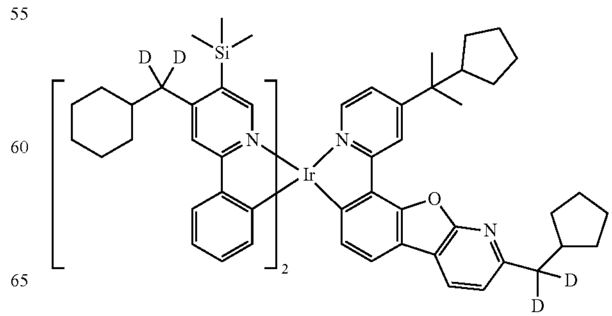

-continued
574
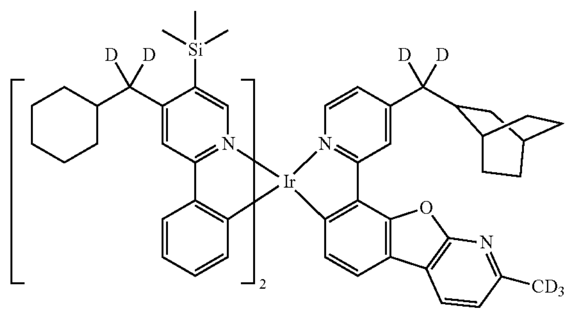
575
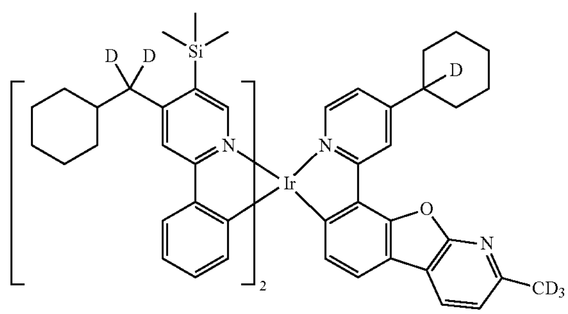
576
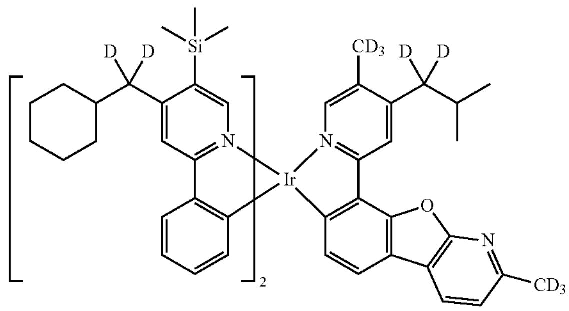
577
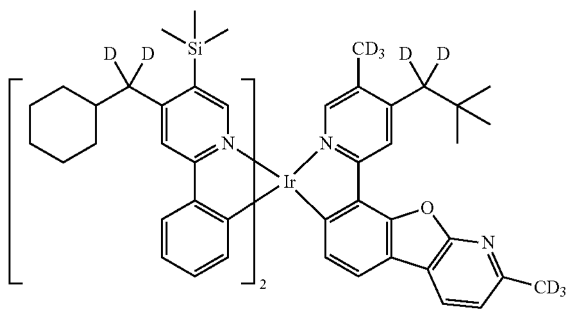
-continued
578
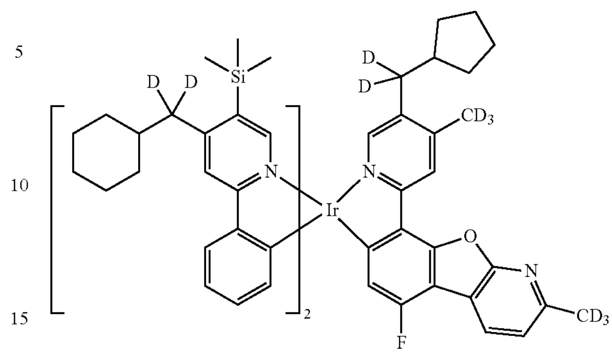
579
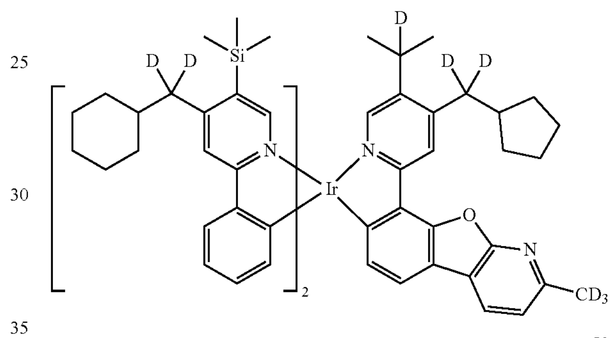
580
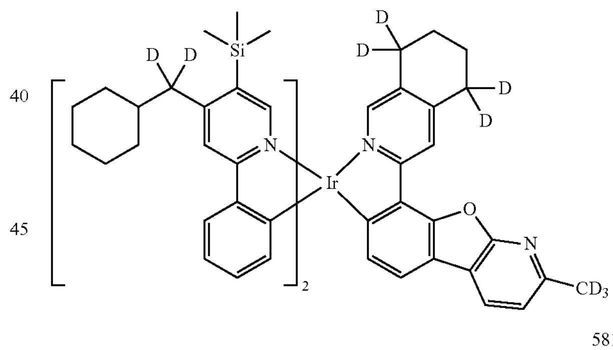
581
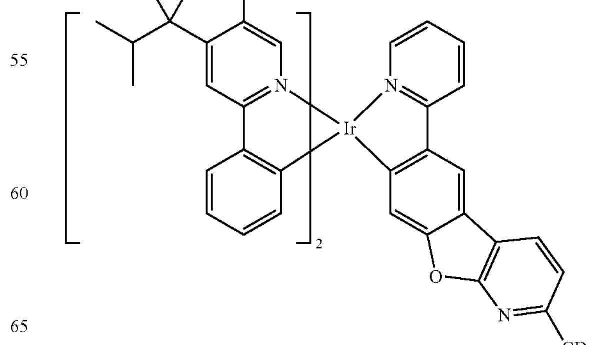

-continued
582
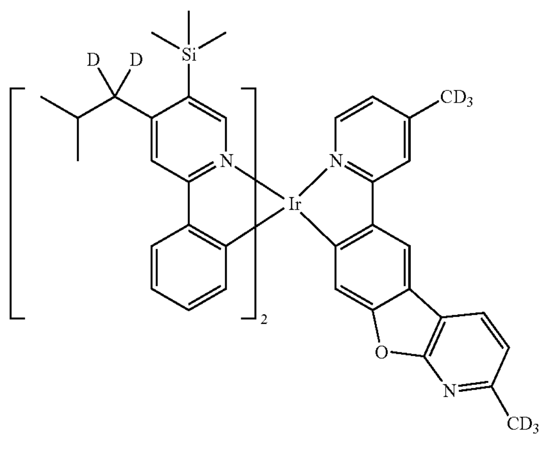
583
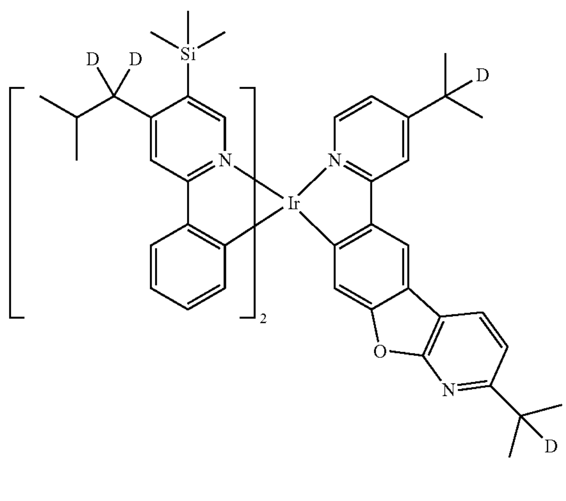
584
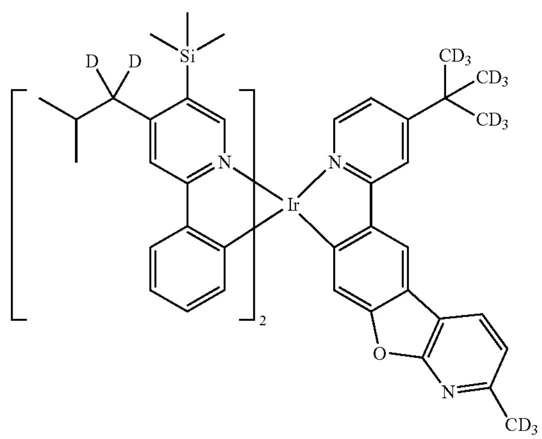
-continued
585
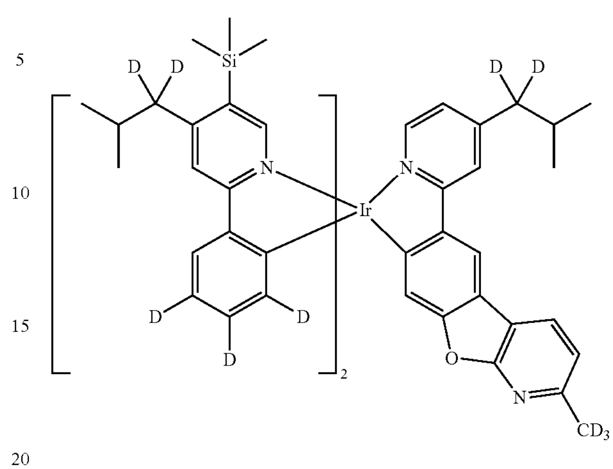
586
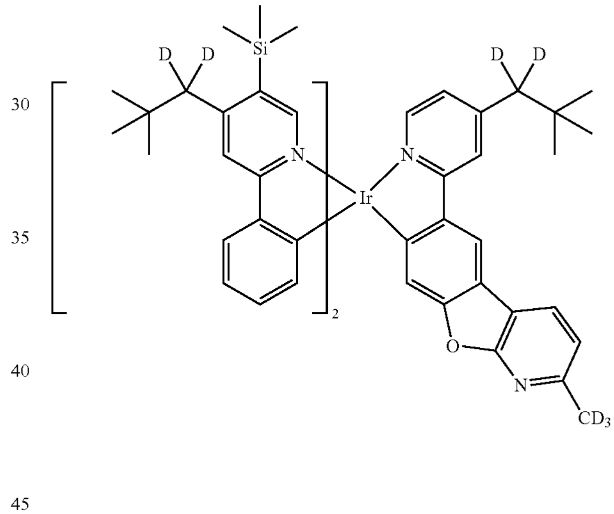
587
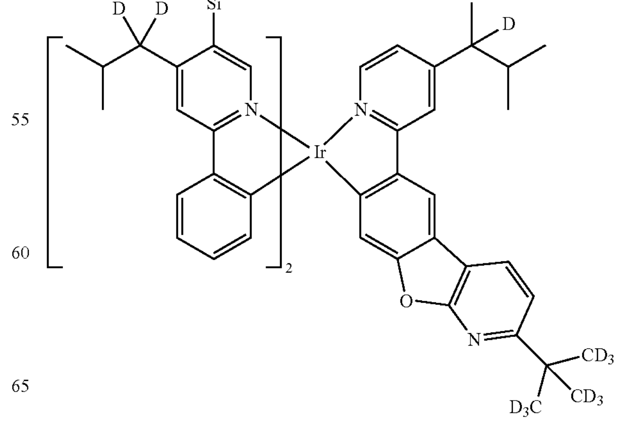

588
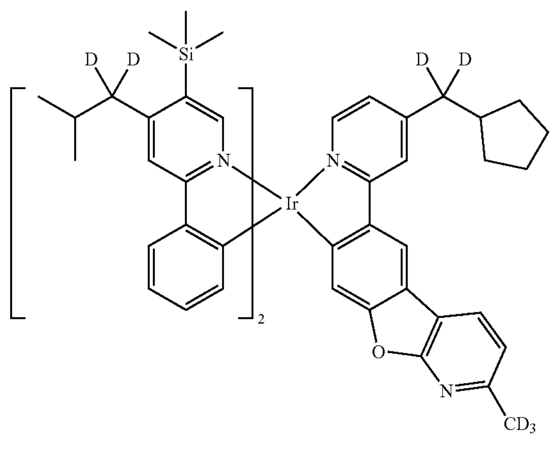
589
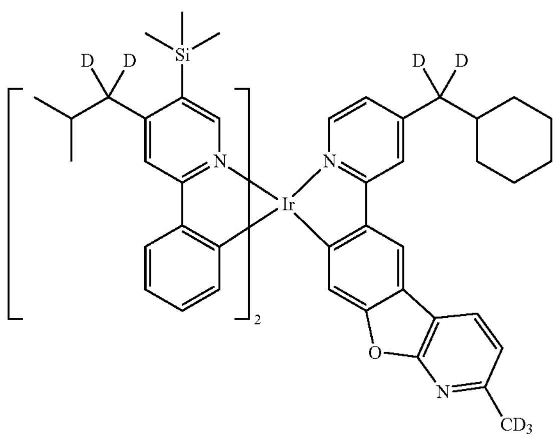
590
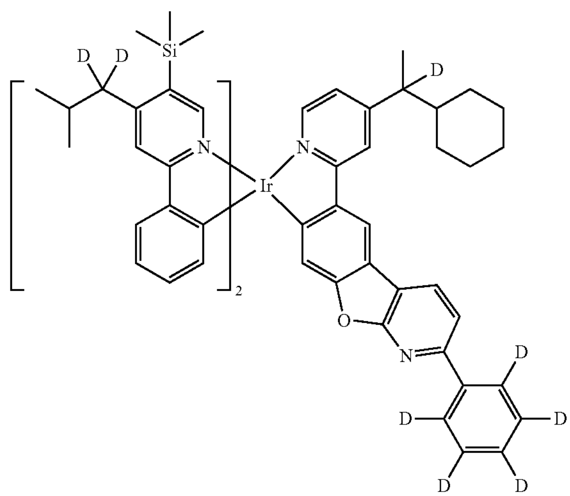
591
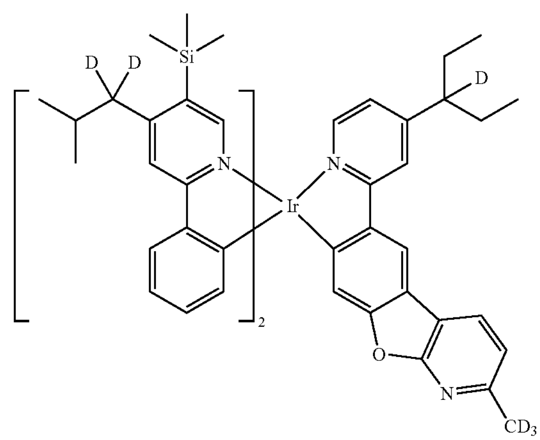
592
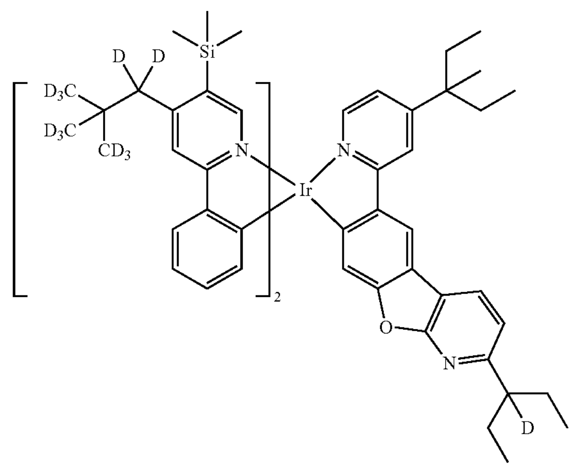
593
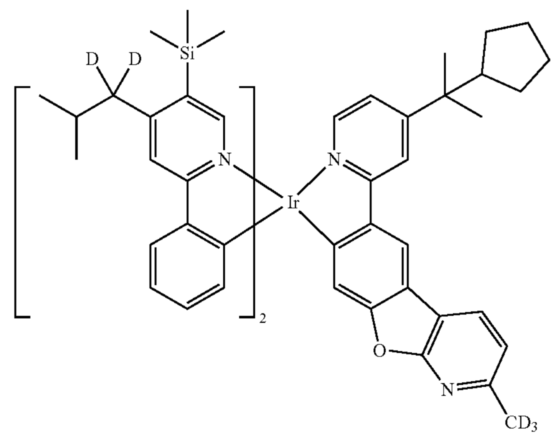

-continued
594
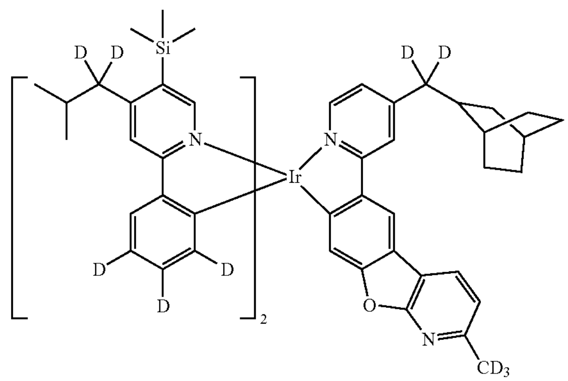
595
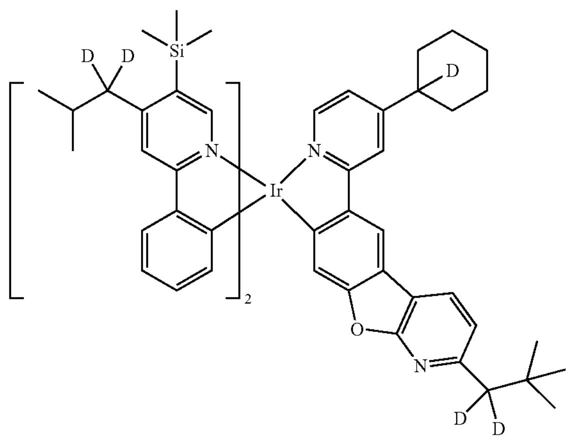
596
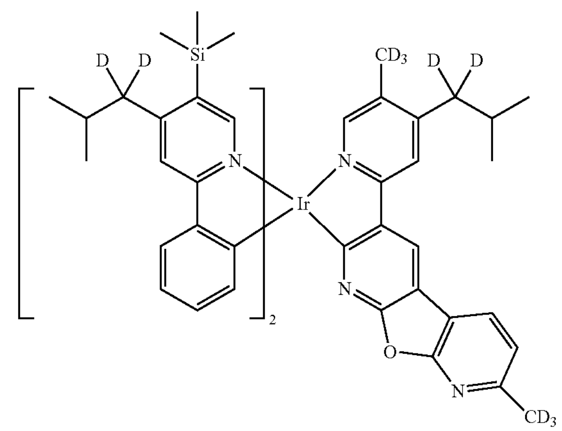
-continued
597
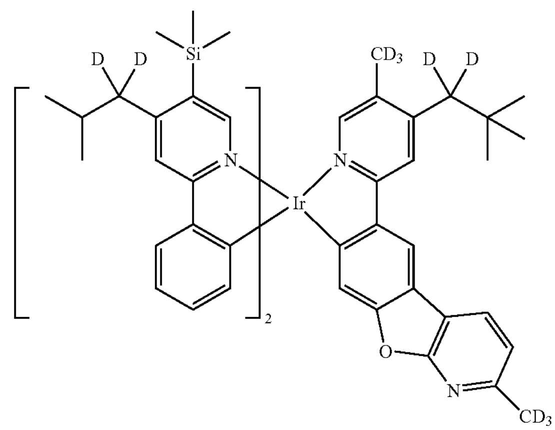
598
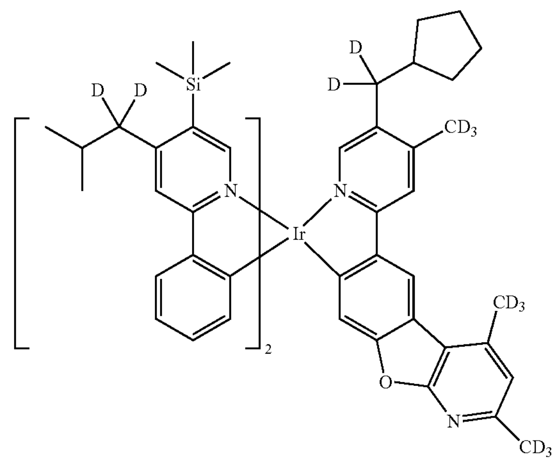
599
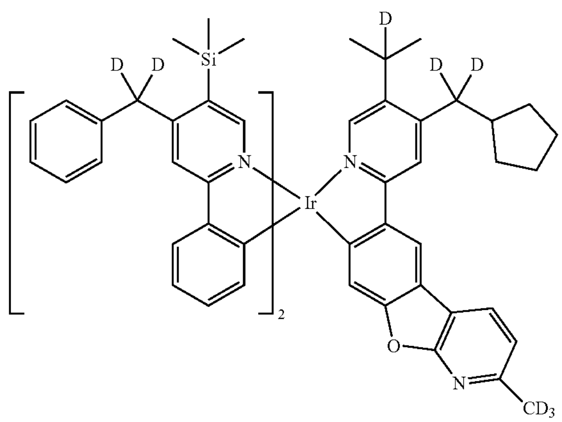

600
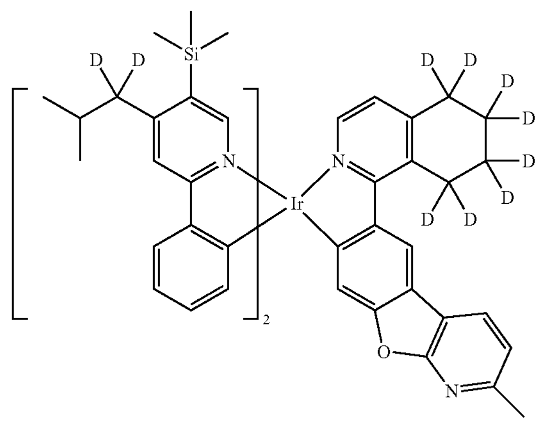
601
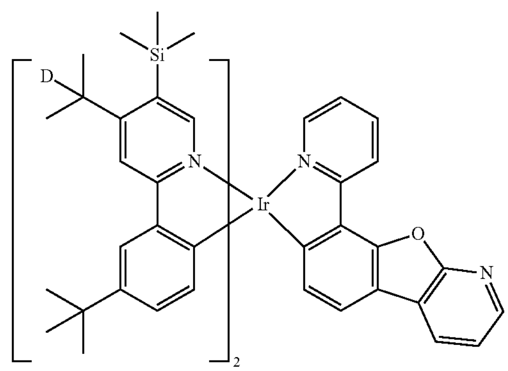
602
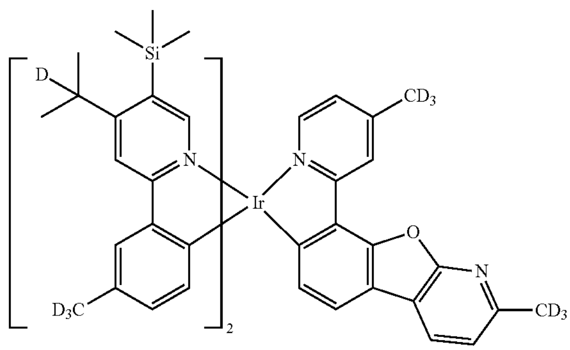
603
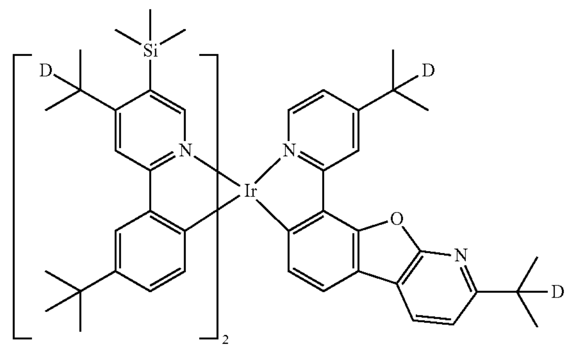
604
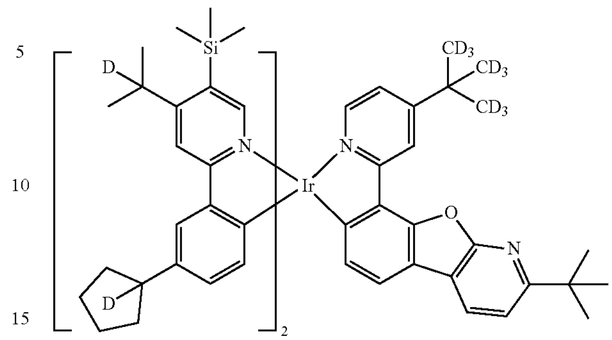
605
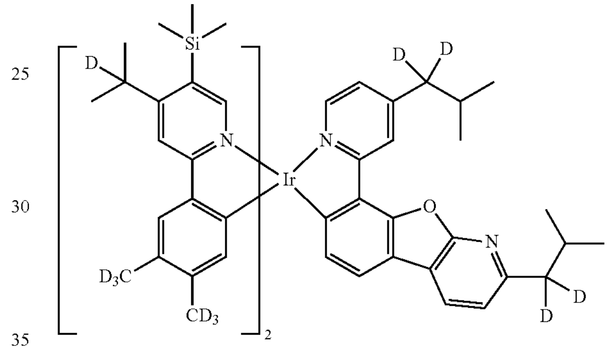
606
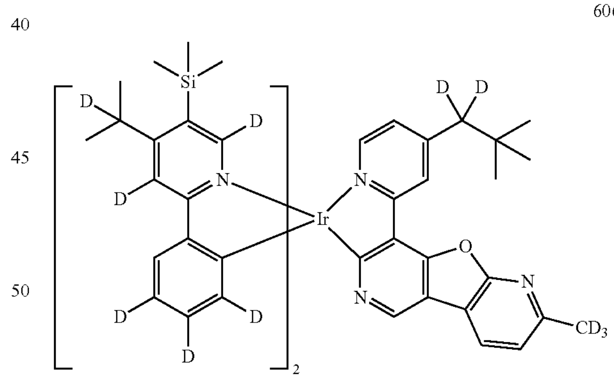
607
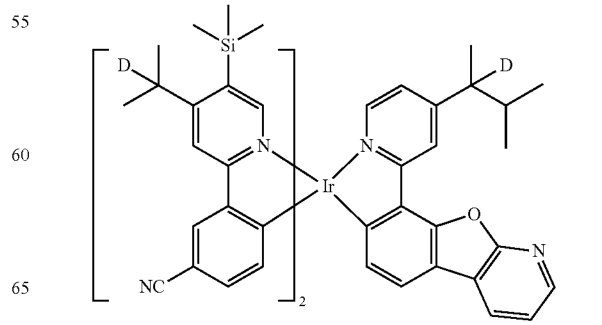

608
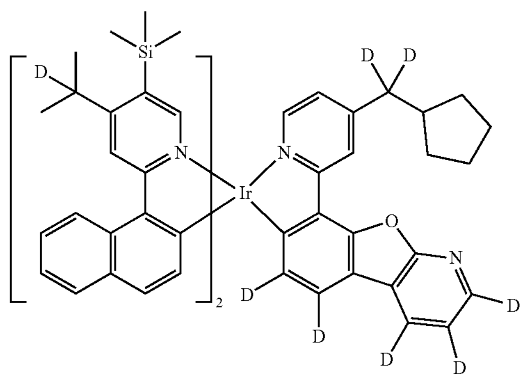
609
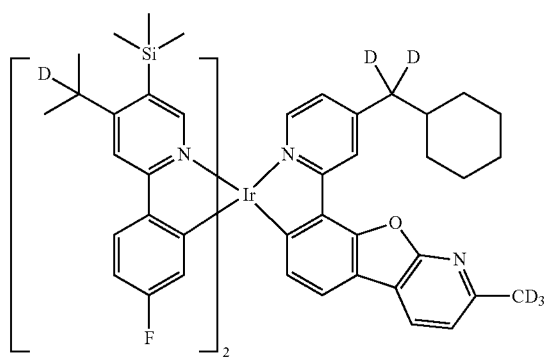
610
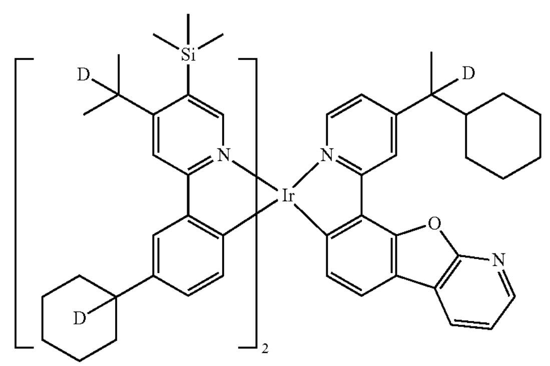
611
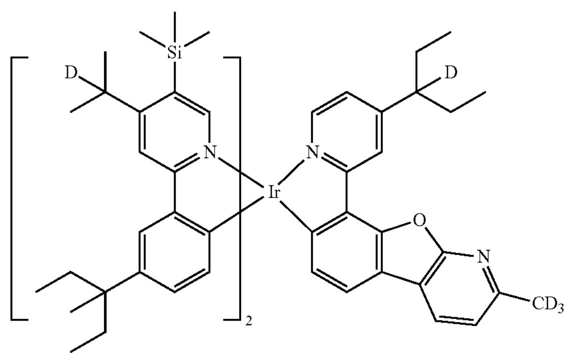
612
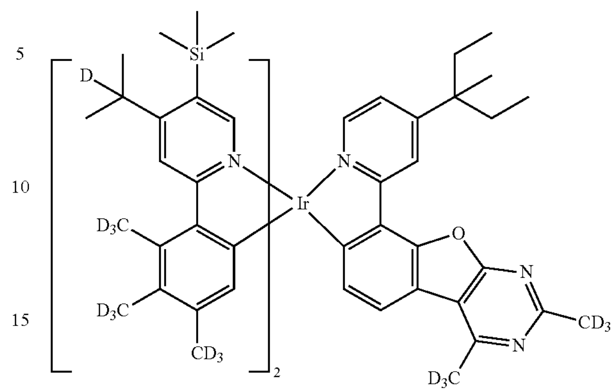
613
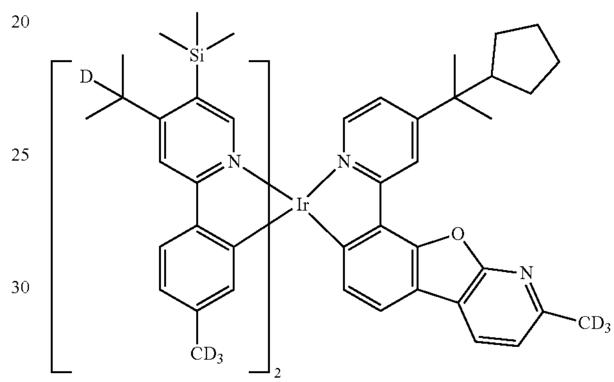
614
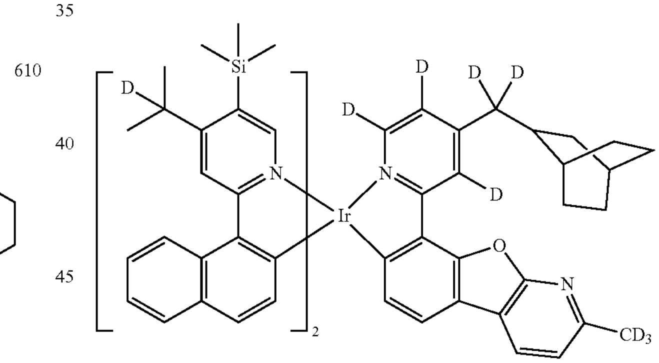
615
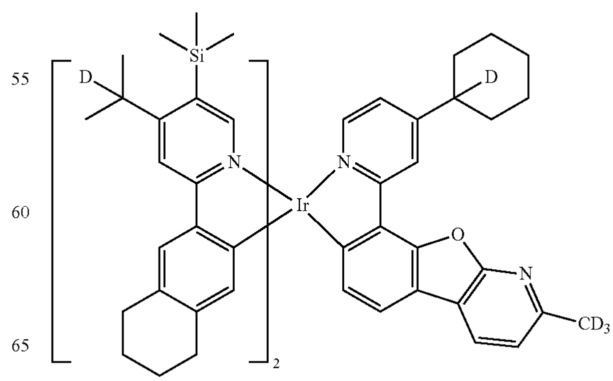

-continued
616
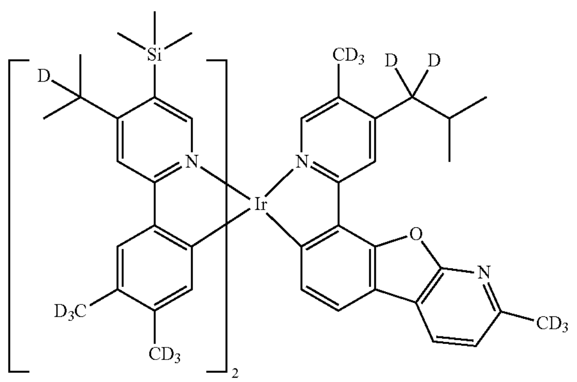
617
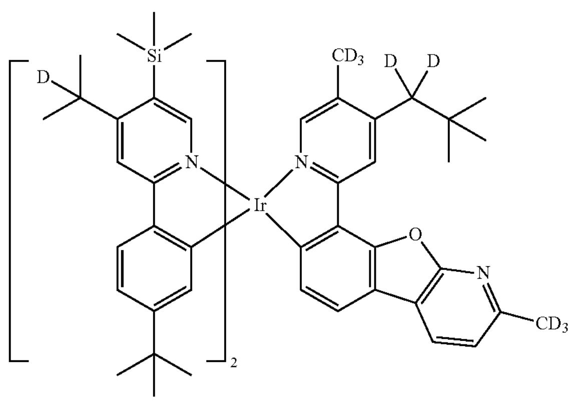
618
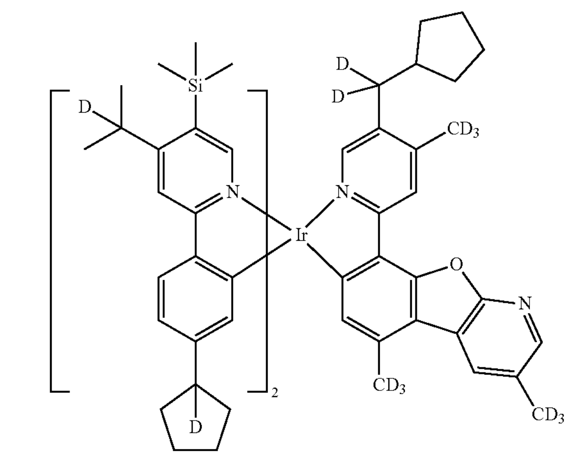
619
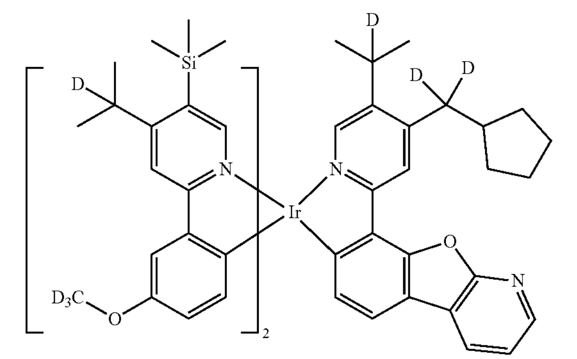
-continued
620
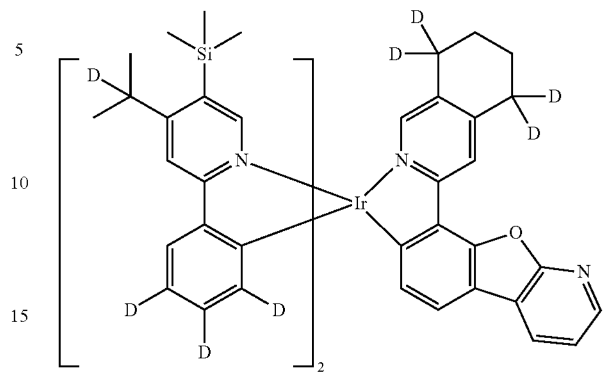
621
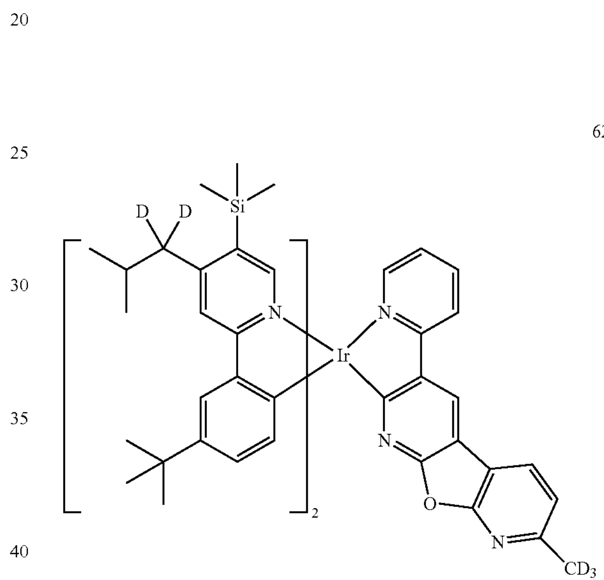
622
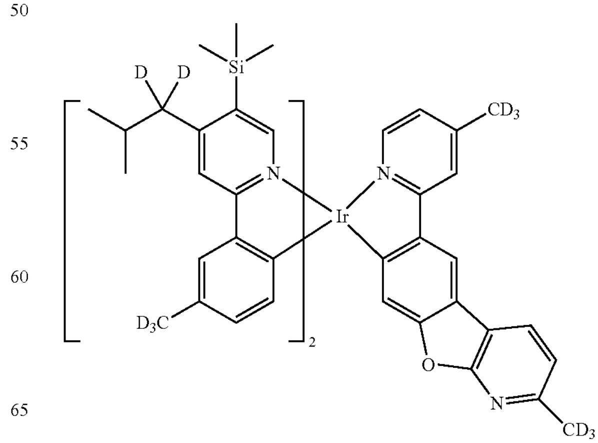

-continued
623
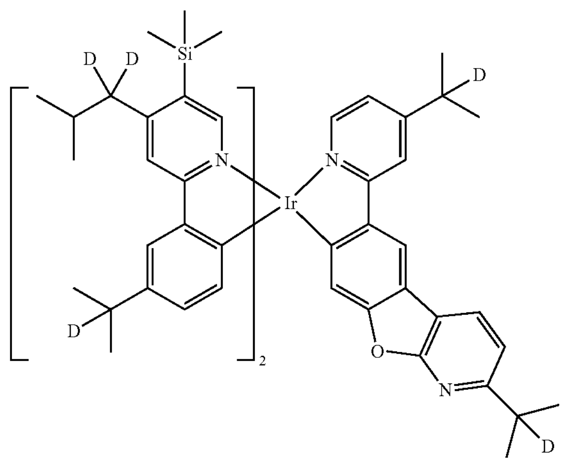
624
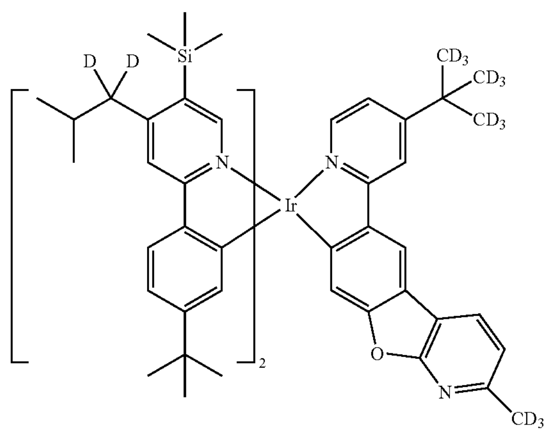
625
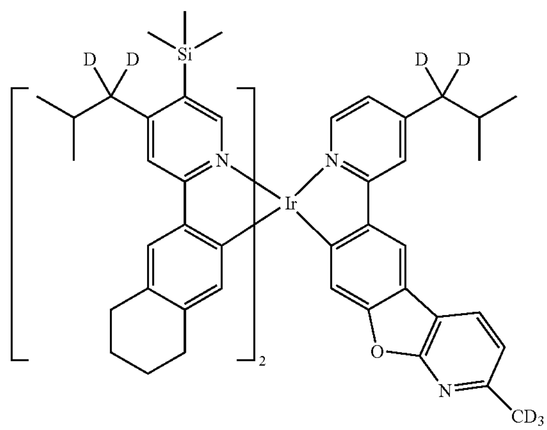
-continued
626
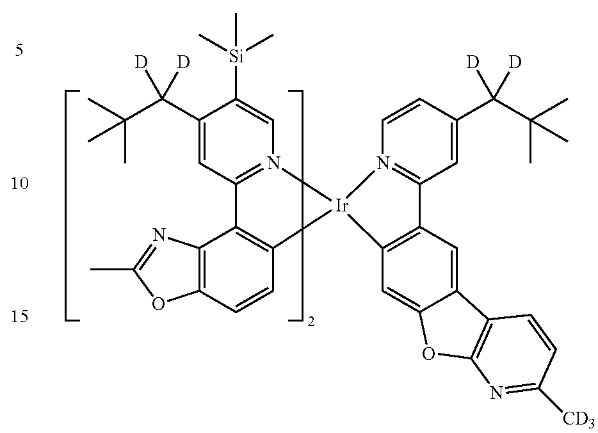
627
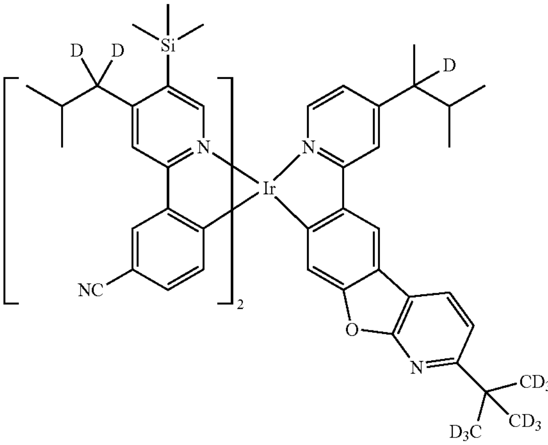
628
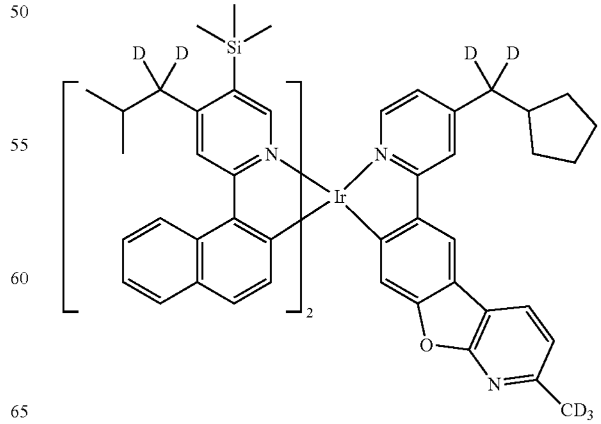

-continued
629
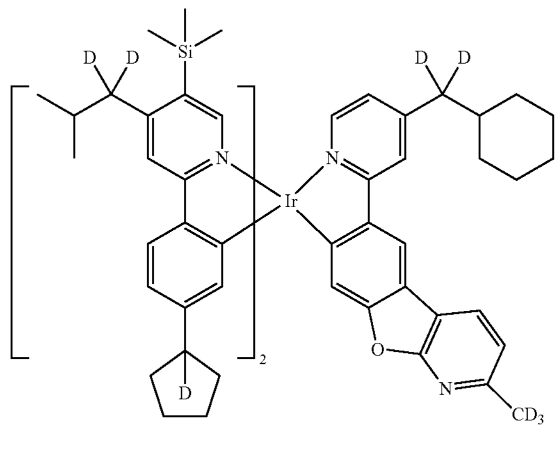
630
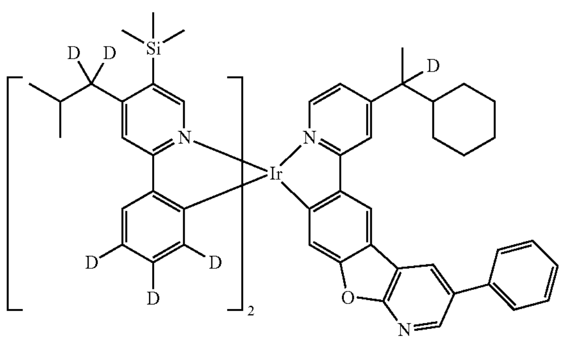
631
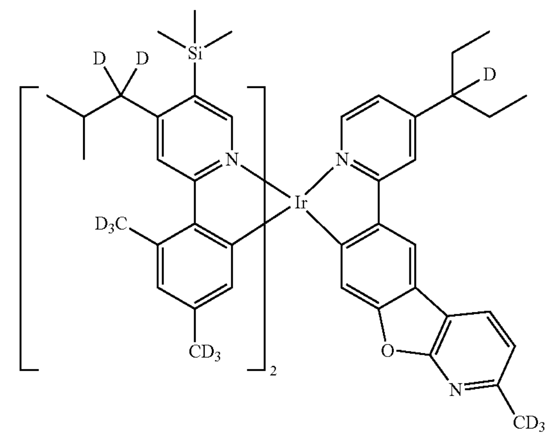
-continued
632
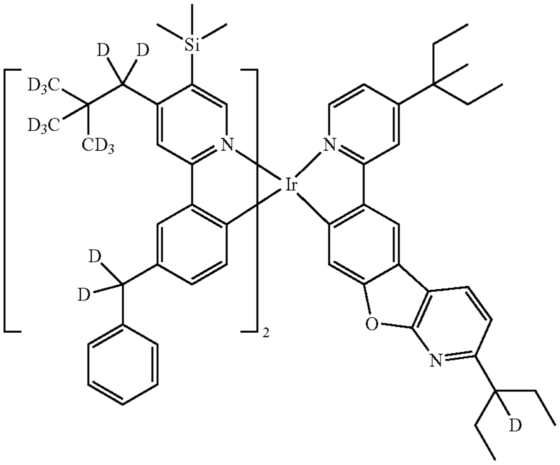
633
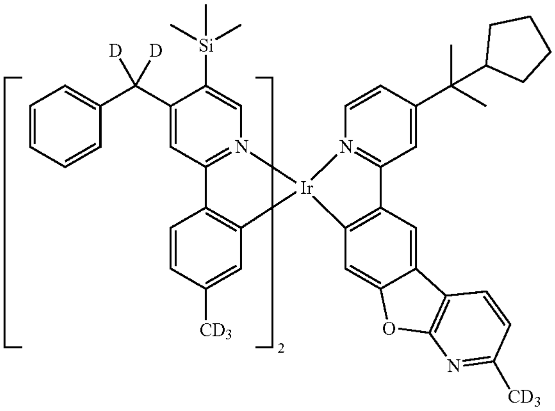
634
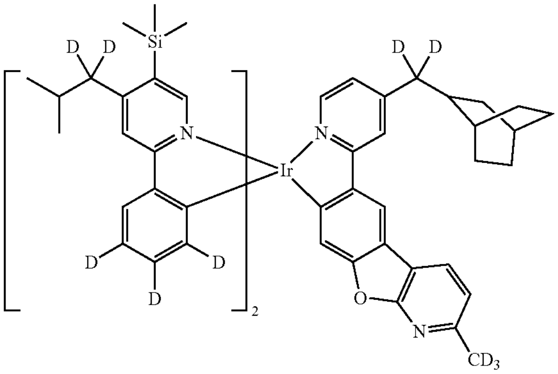

-continued
635
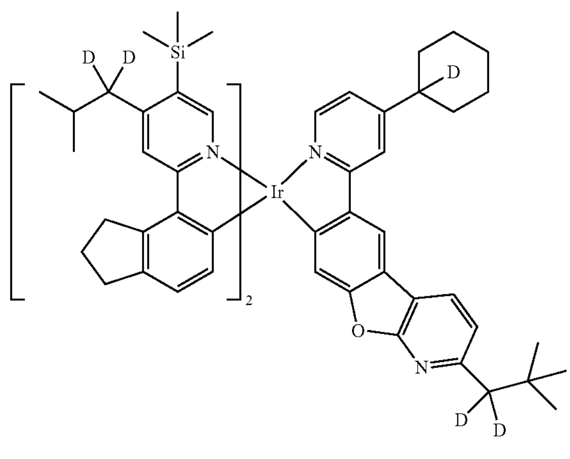
636
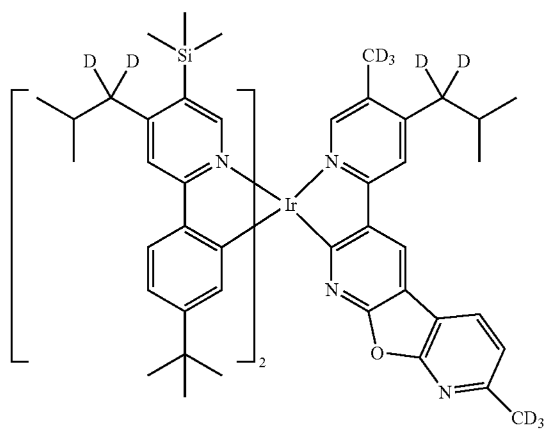
637
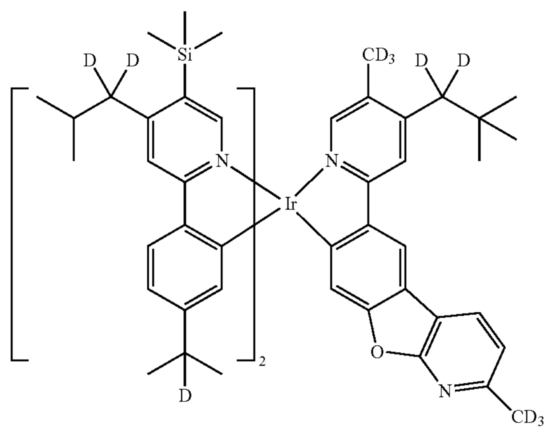
-continued
638
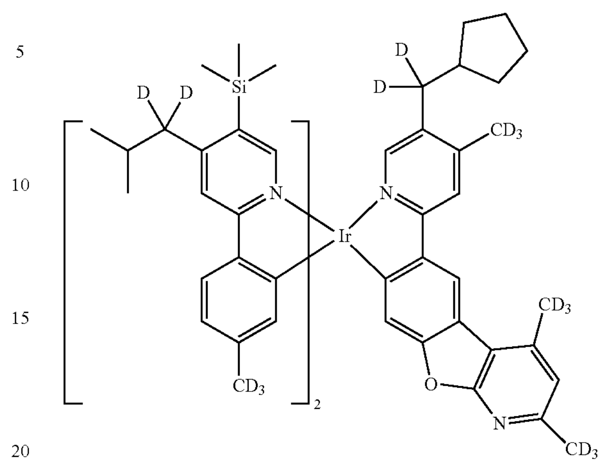
639
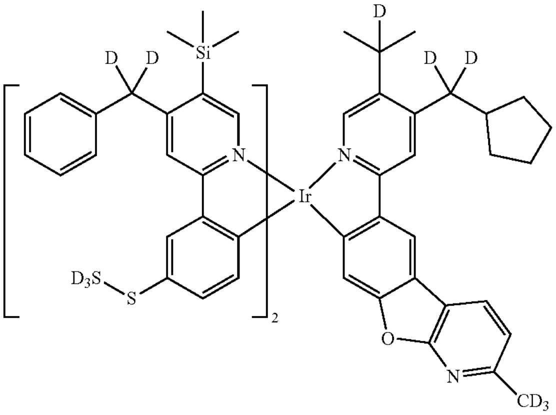
640
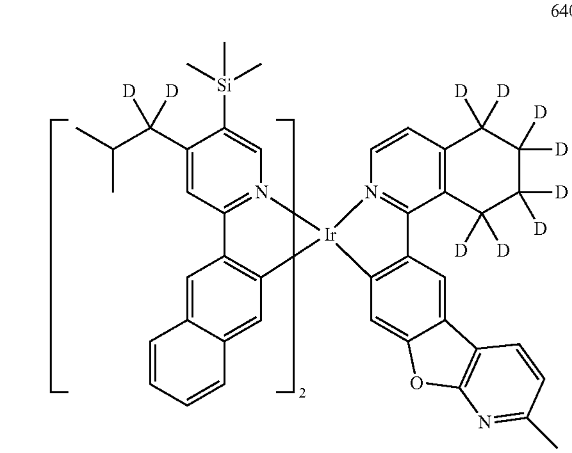

-continued
641
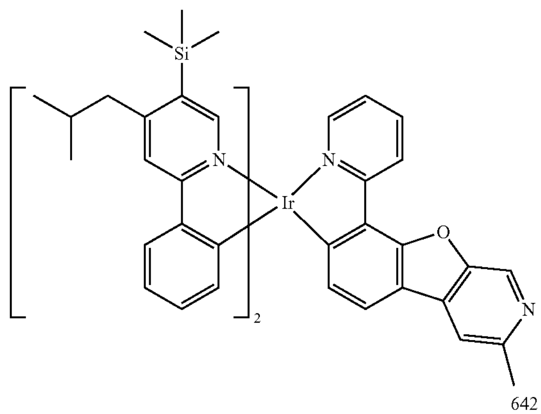
642
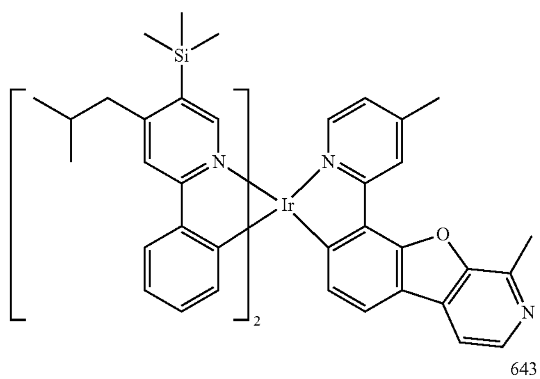
643
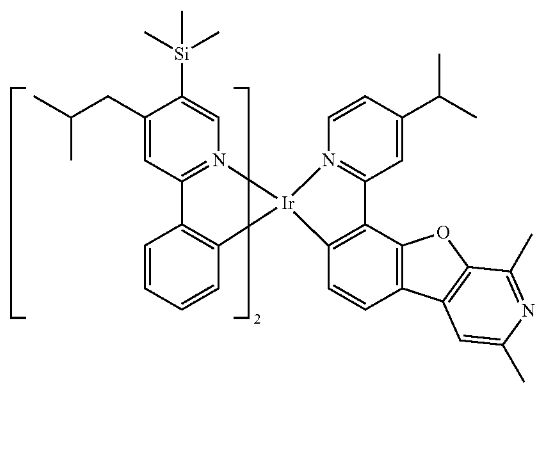
644
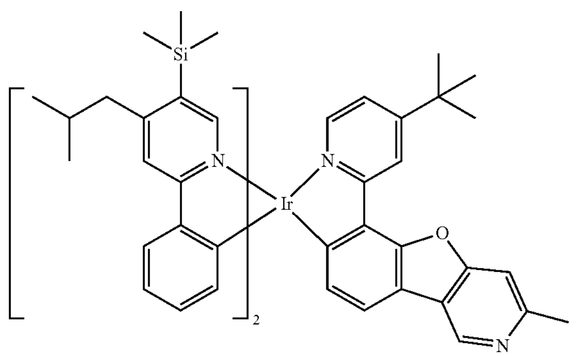
-continued
645
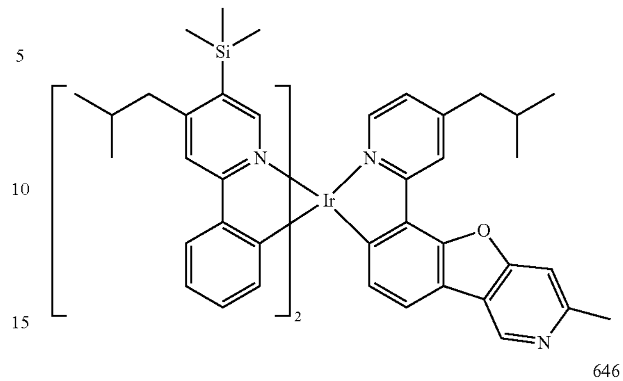
646
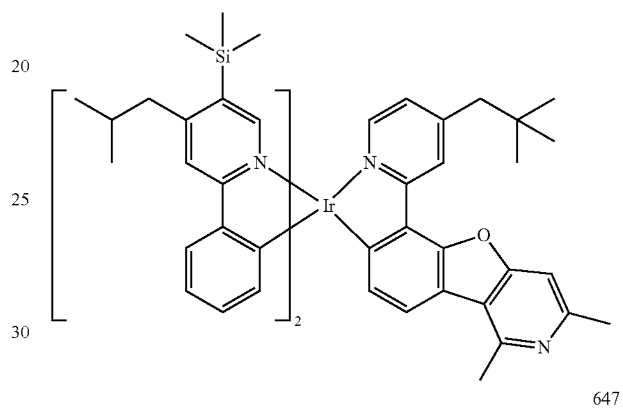
647
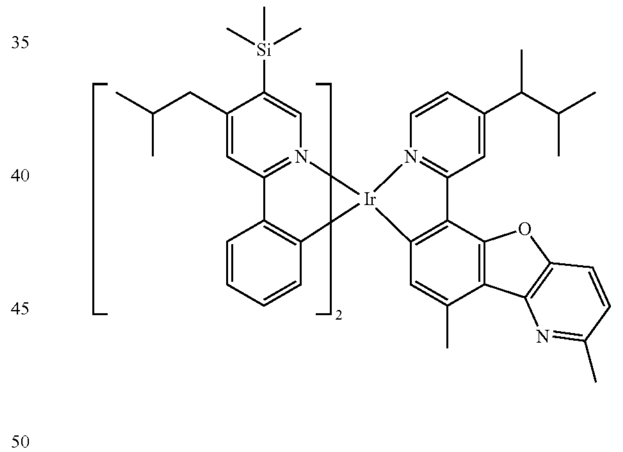
648
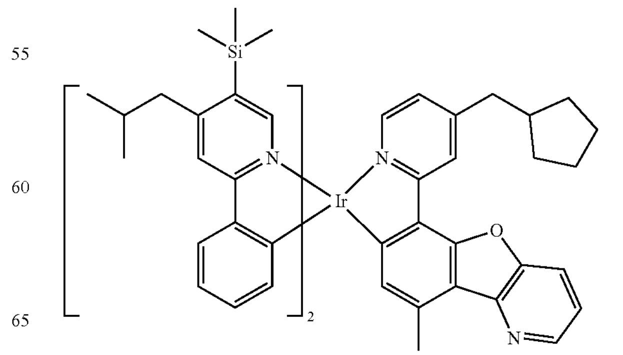

-continued
649
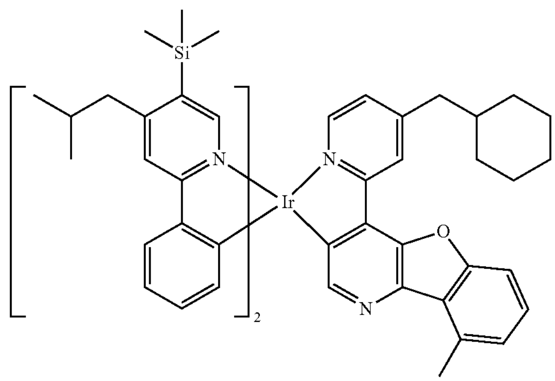
650
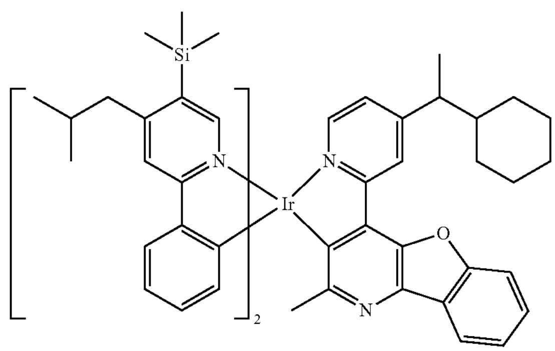
651
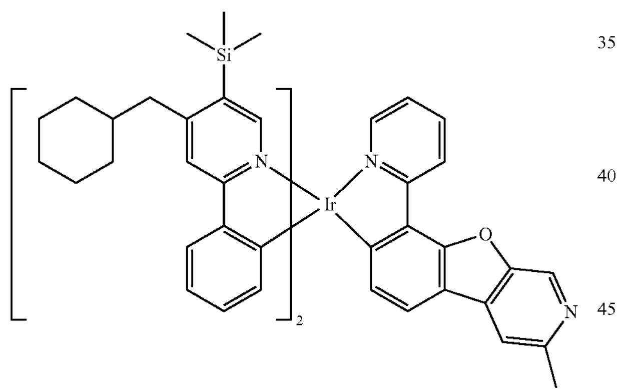
652
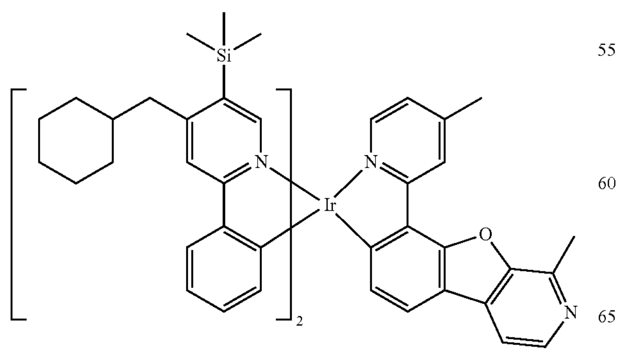
-continued
653
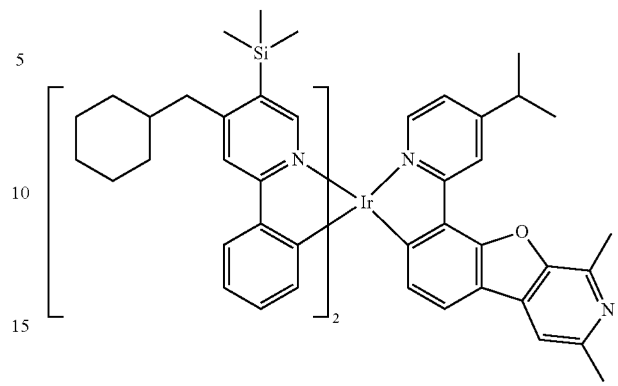
654
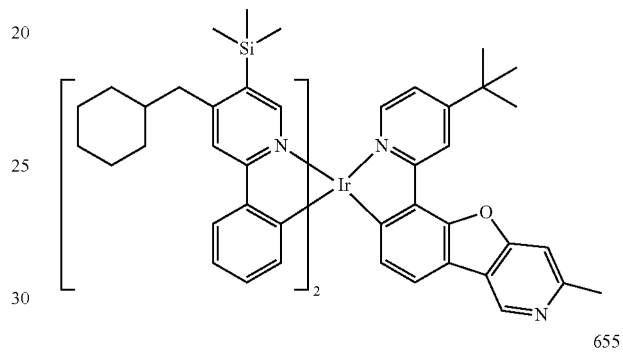
655
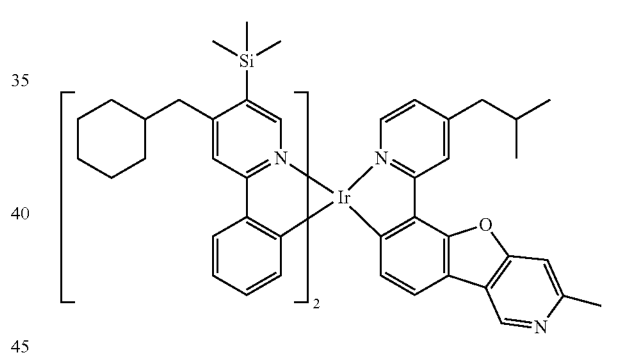
656
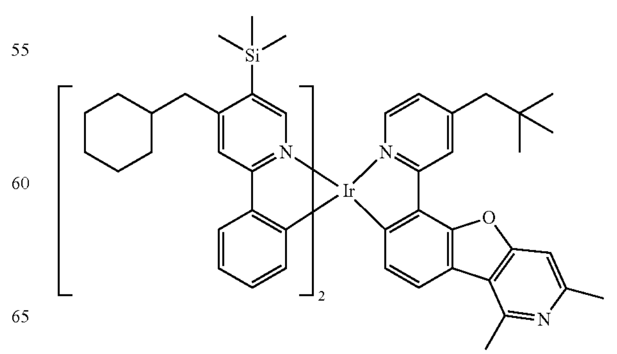

-continued
657
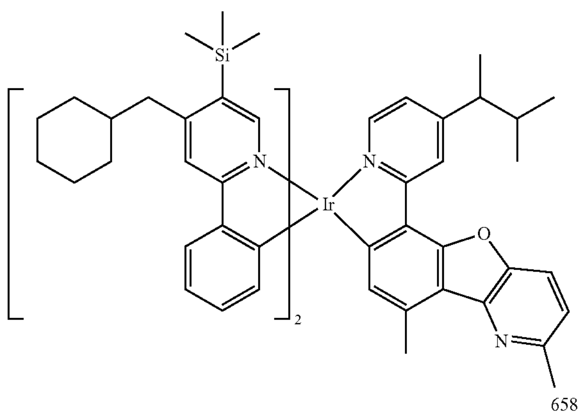
658
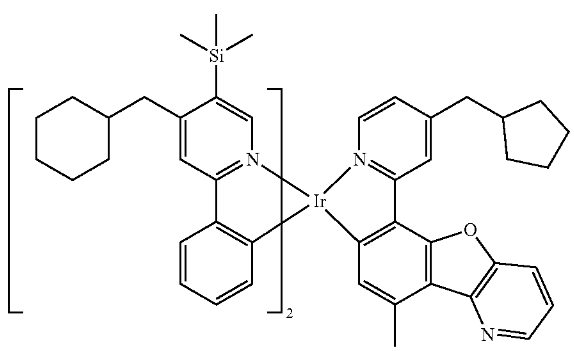
659
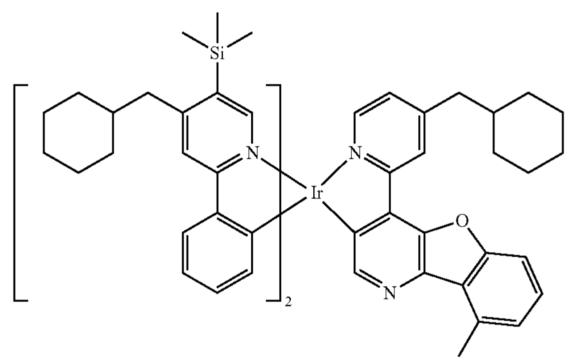
660
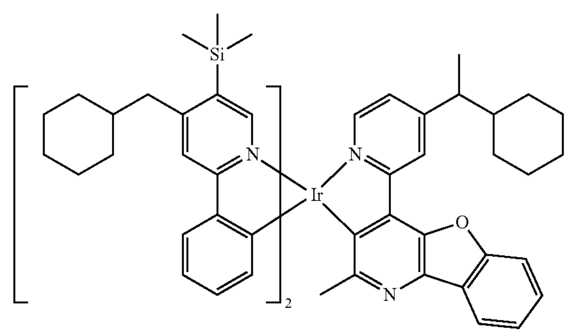
-continued
661
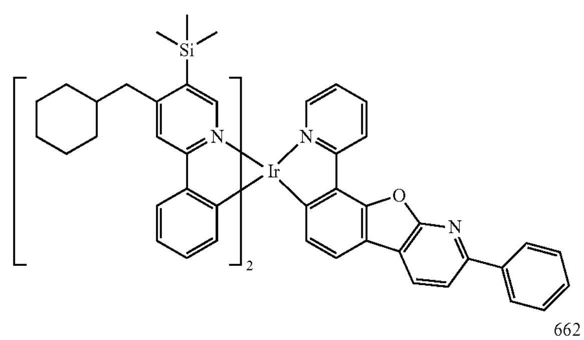
662
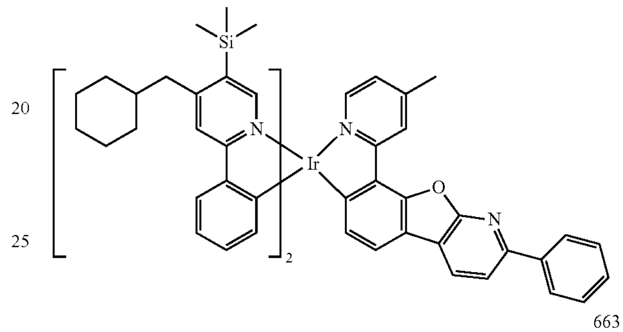
663
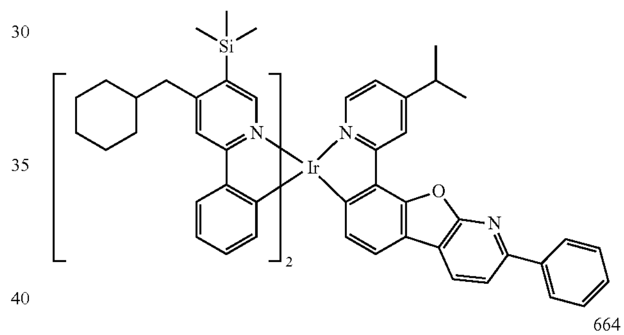
664
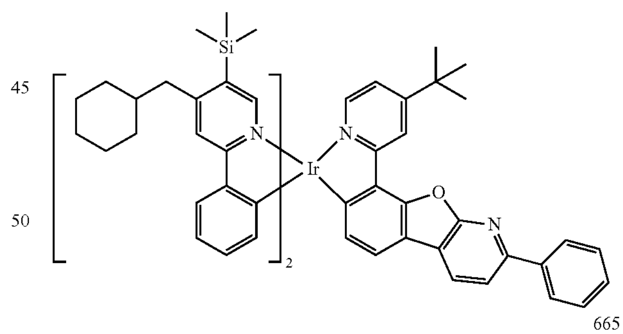
665
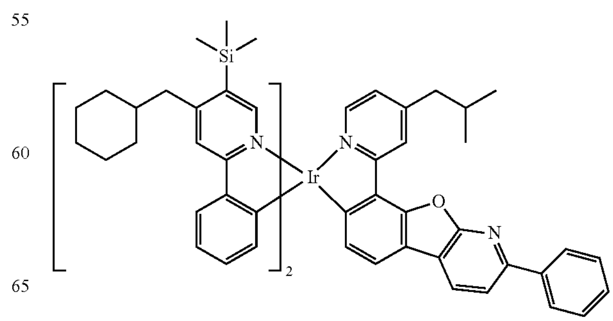

-continued
666
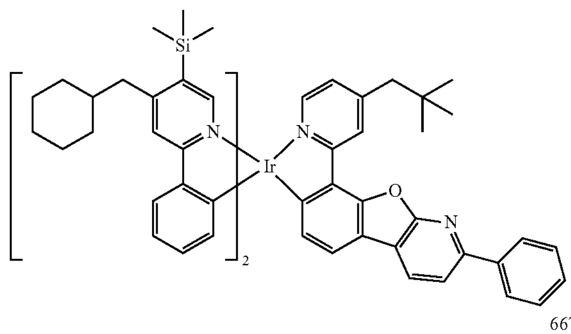
667
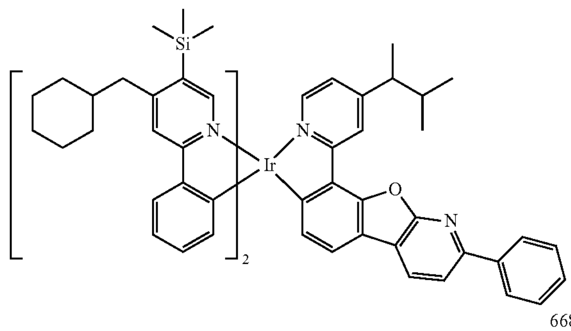
668
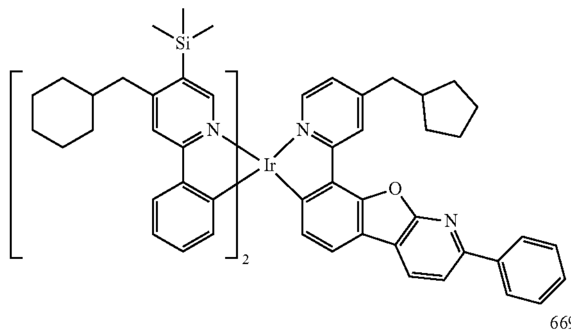
669
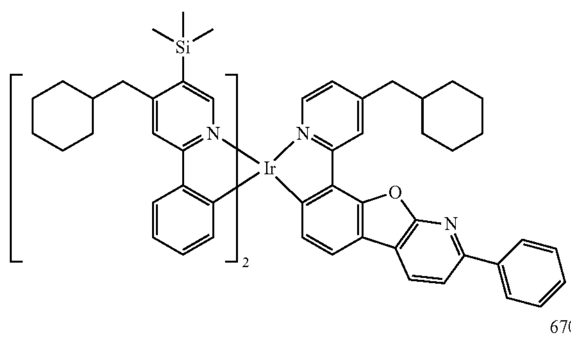
670
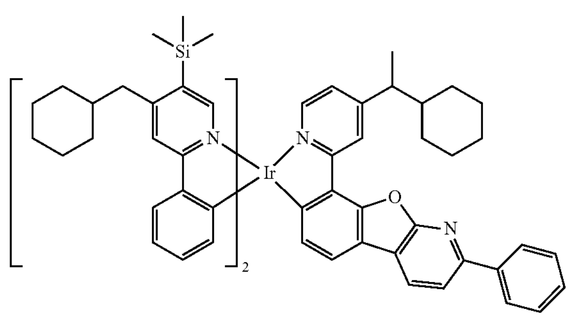
-continued
671
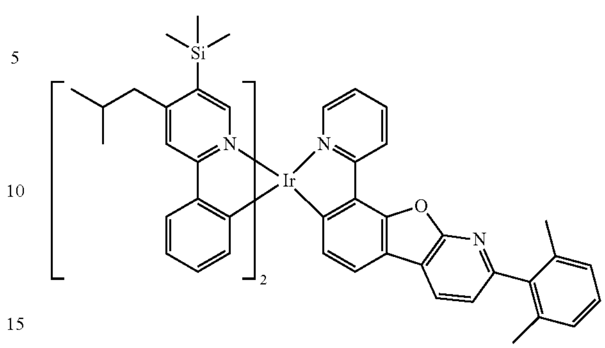
672
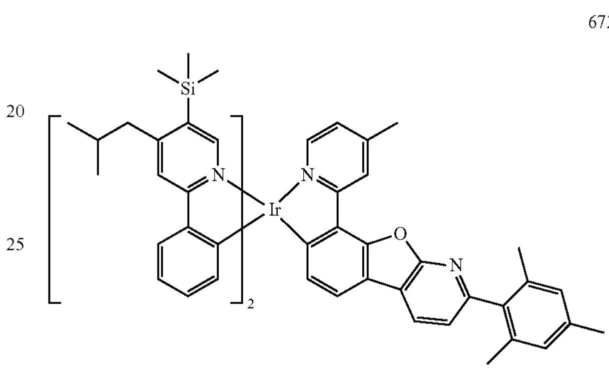
673
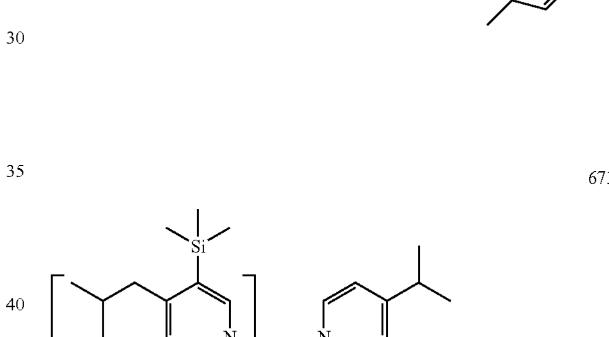
674
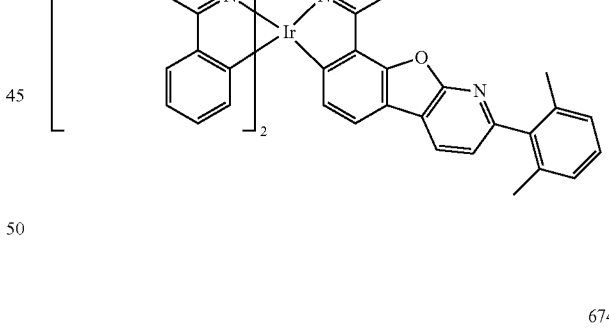
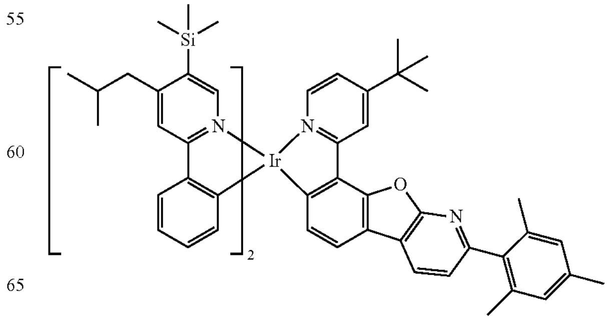

-continued
675
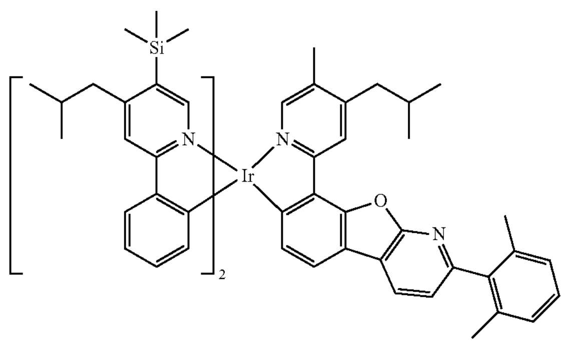
676
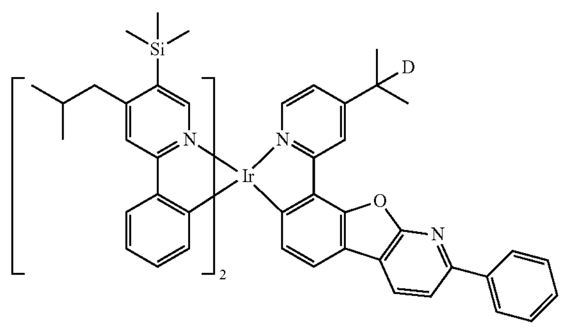
677
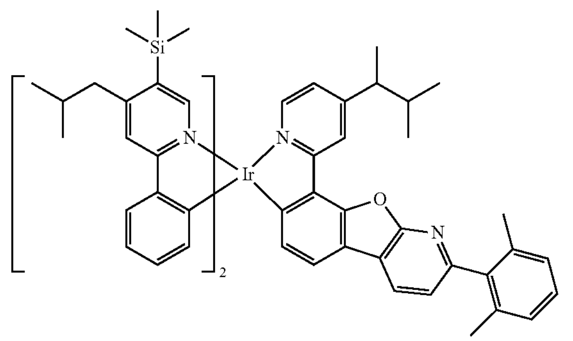
678
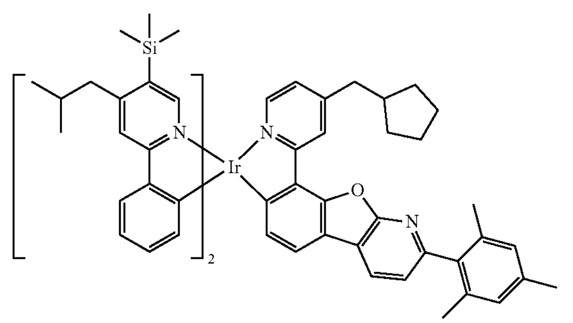
-continued
679
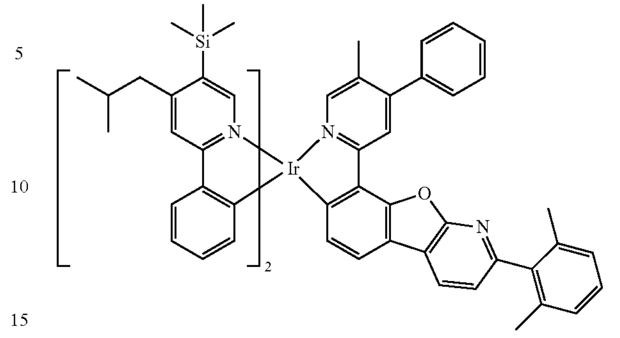
680
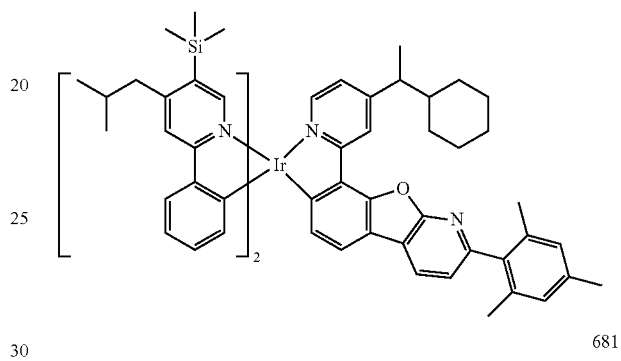
681
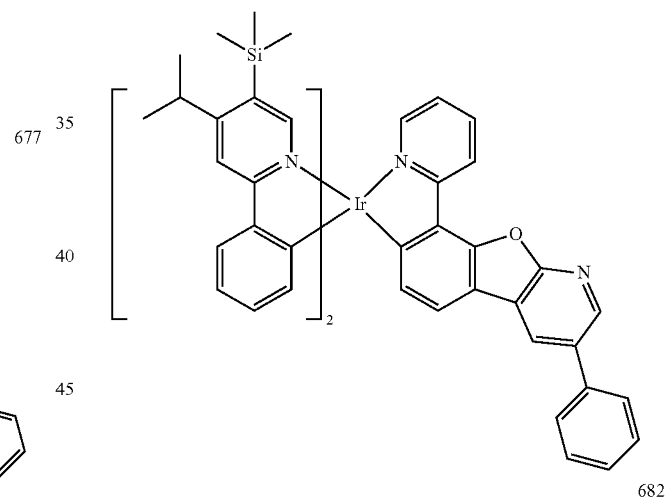
682
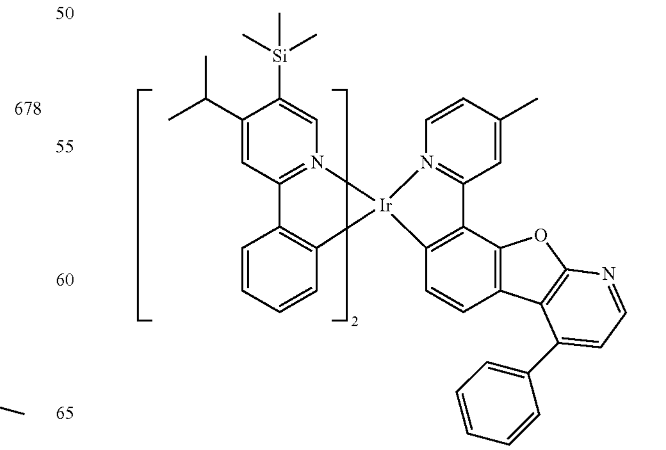

-continued
683
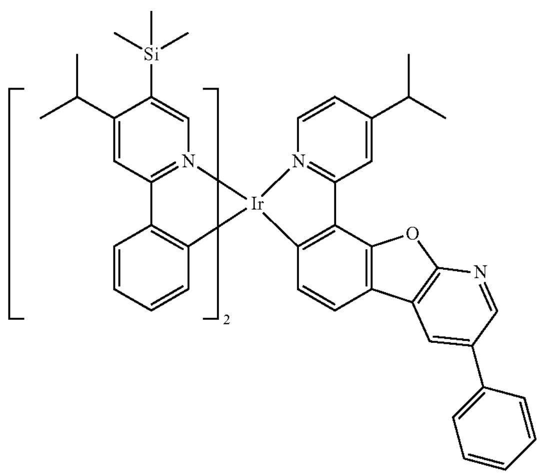
684
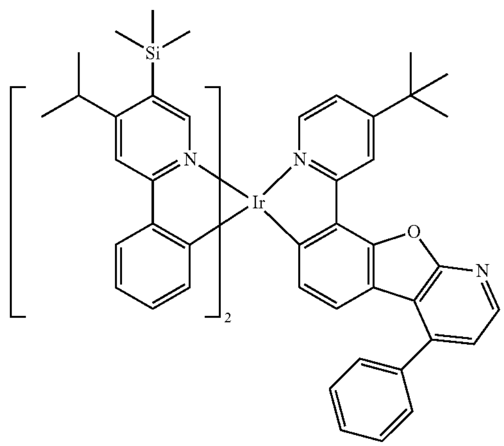
685
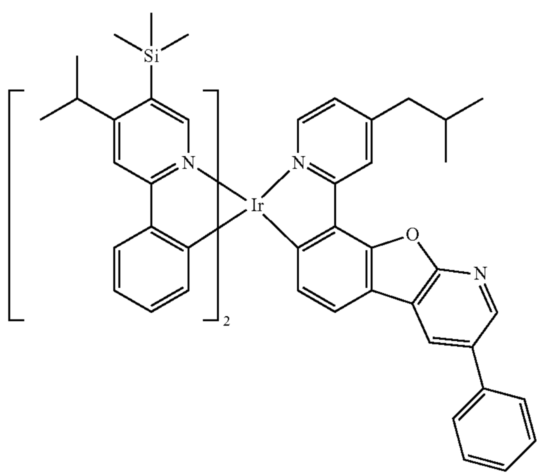
-continued
686
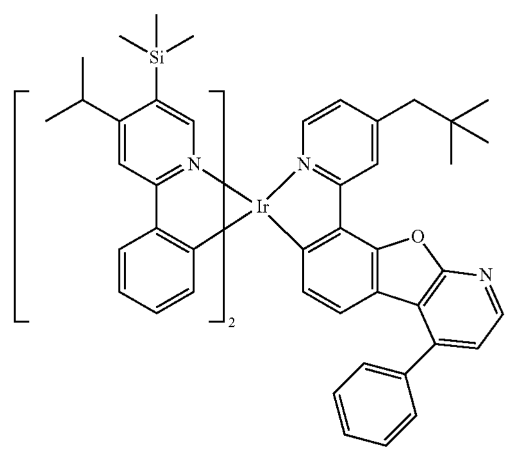
687
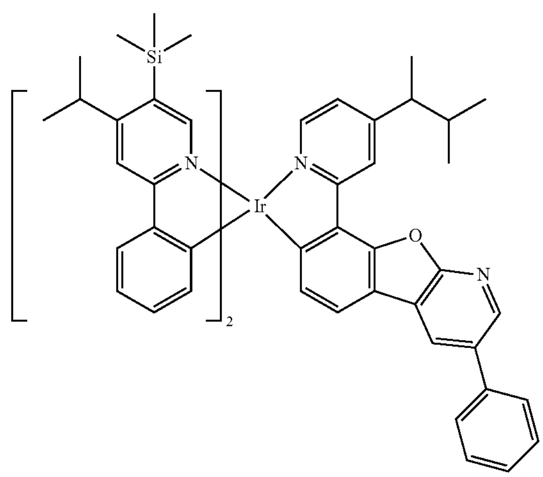
688
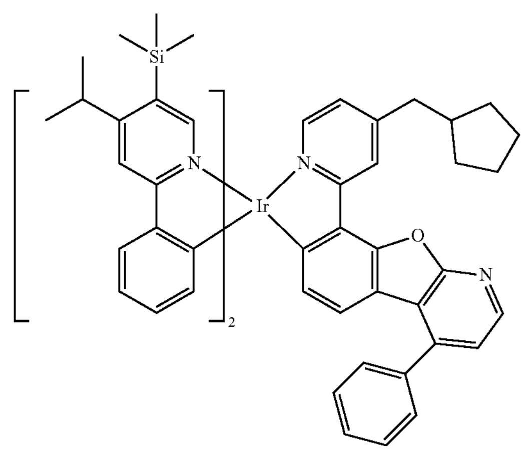

-continued
689
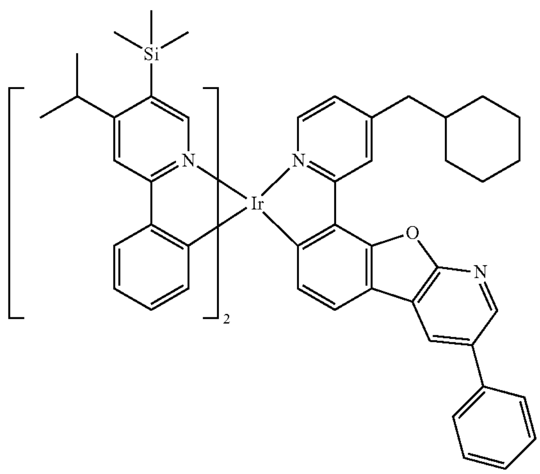
690
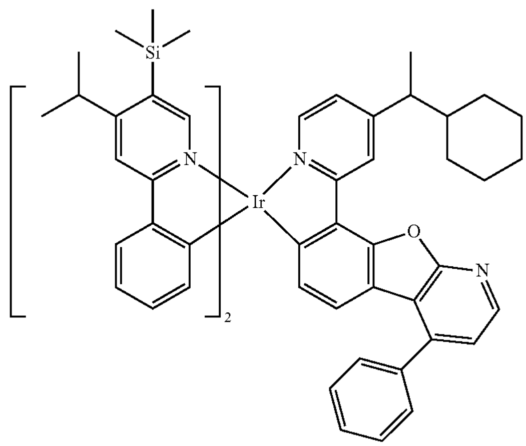
691
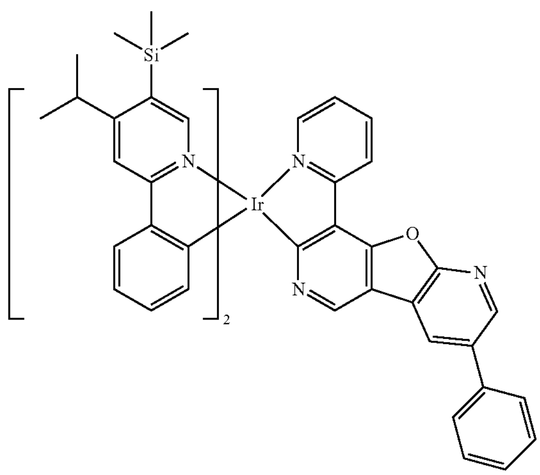
-continued
692
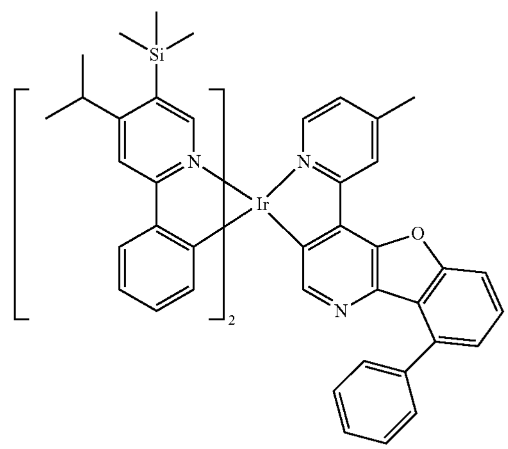
693
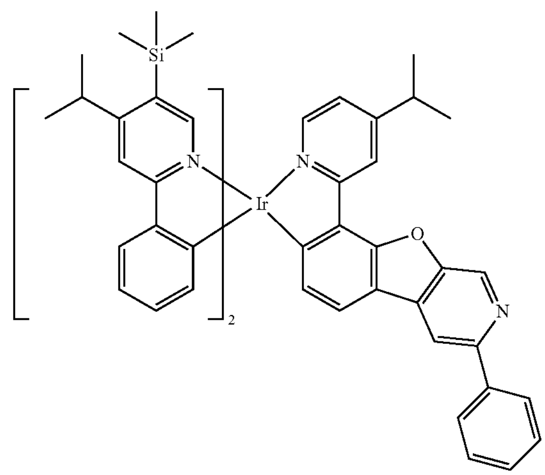
694
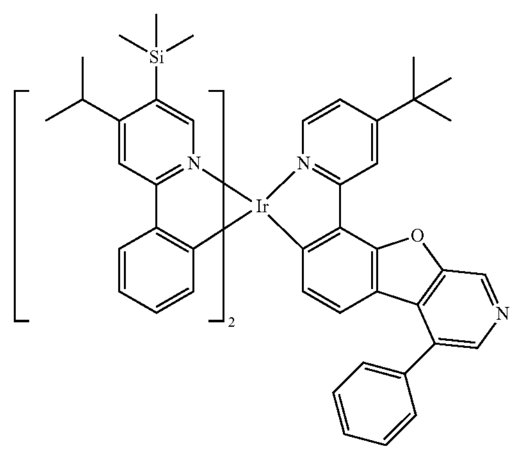

-continued
695
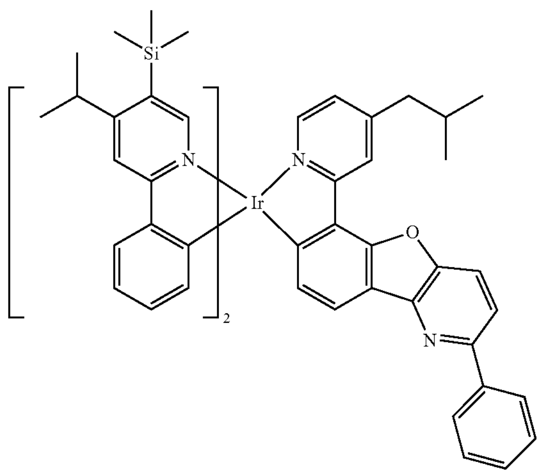
696
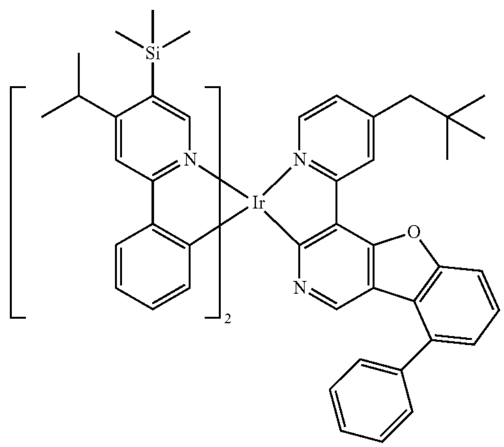
697
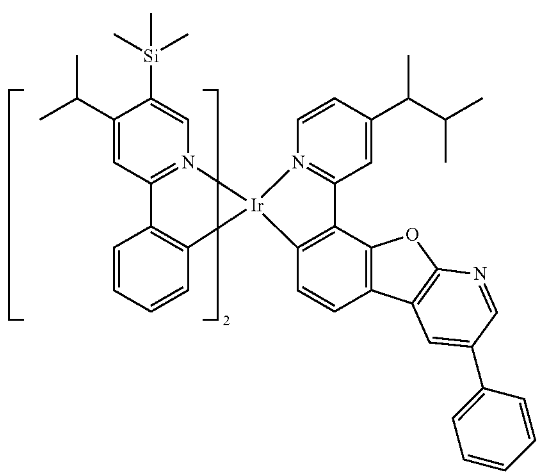
-continued
698
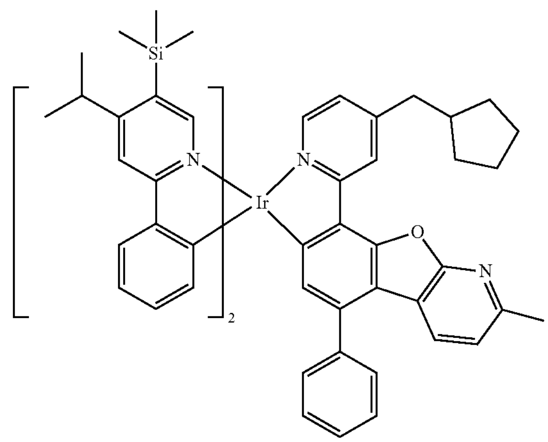
699
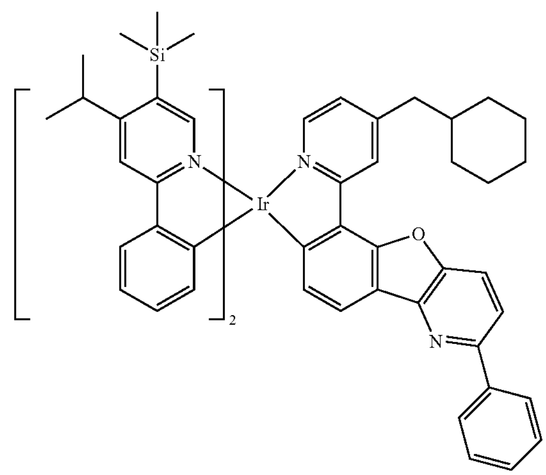
700
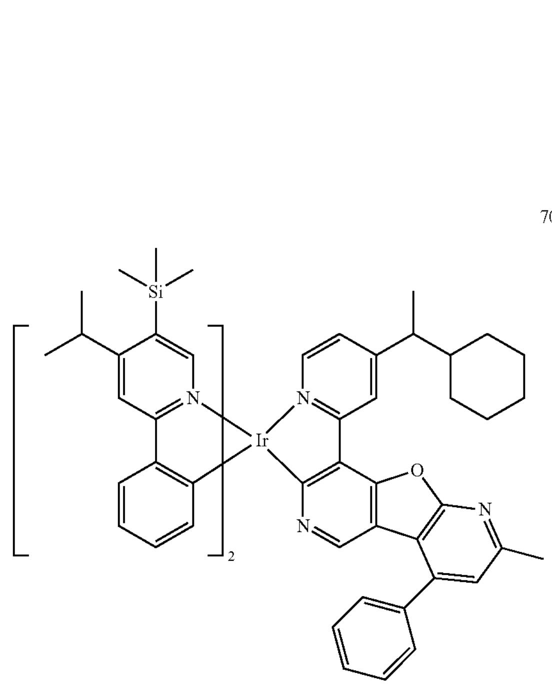

-continued
701
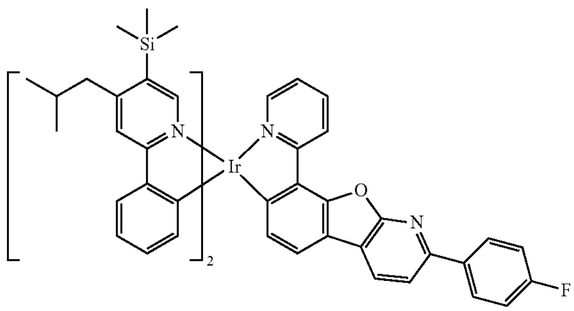
702
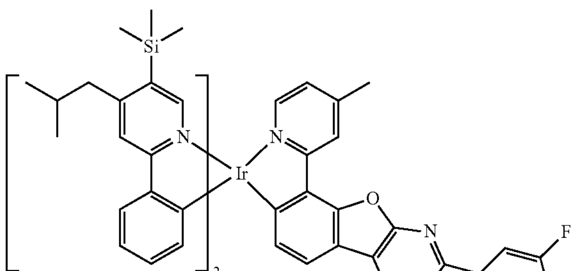
703
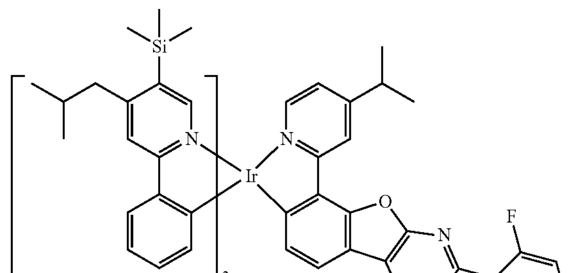
704
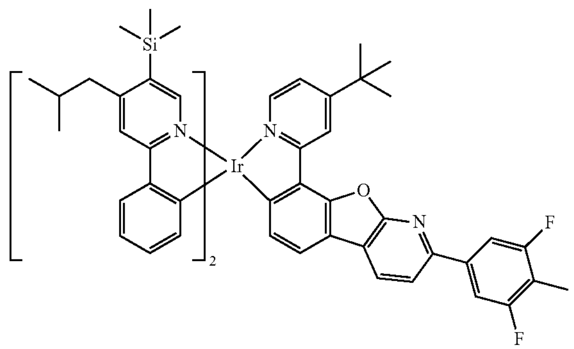
-continued
705
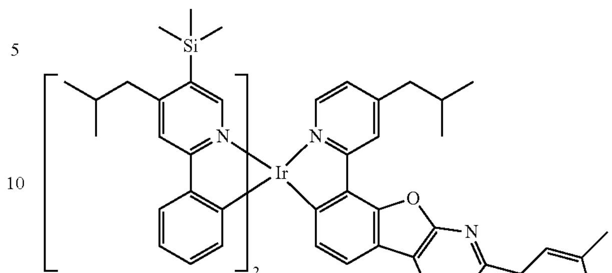
706
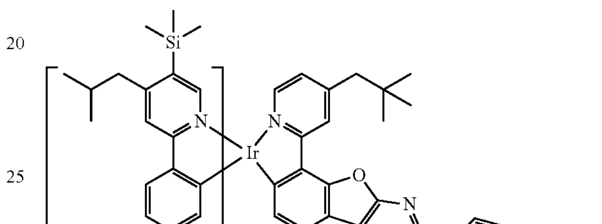
707
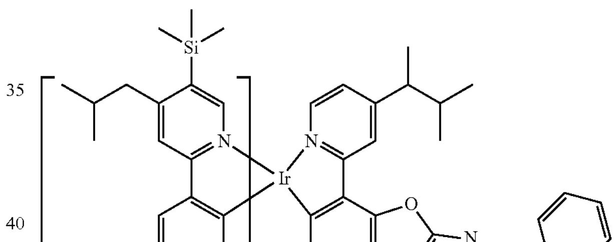
708
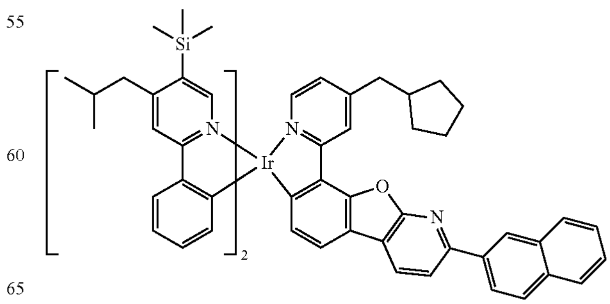

-continued
709
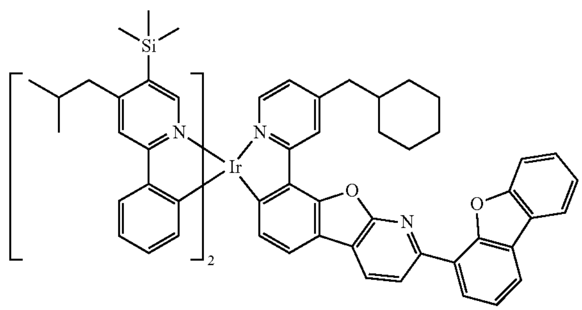
710
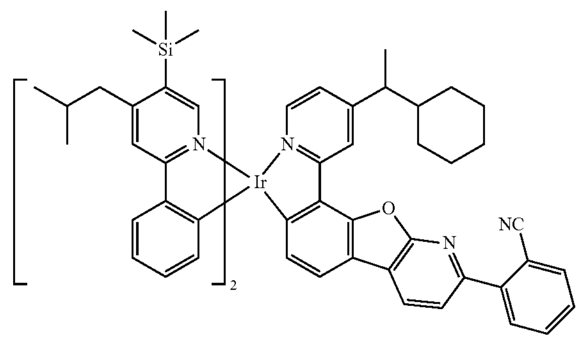
711
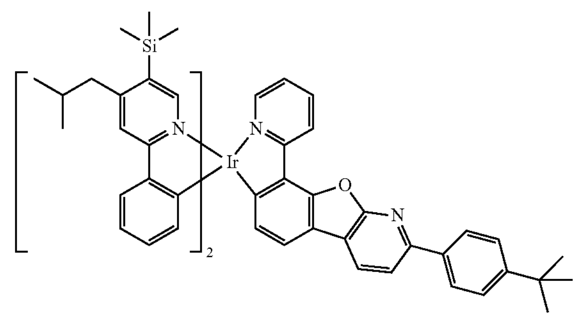
712
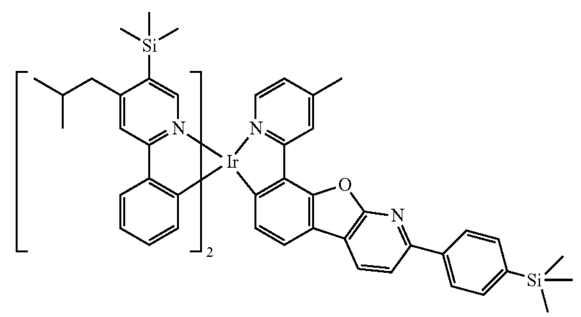
-continued
713
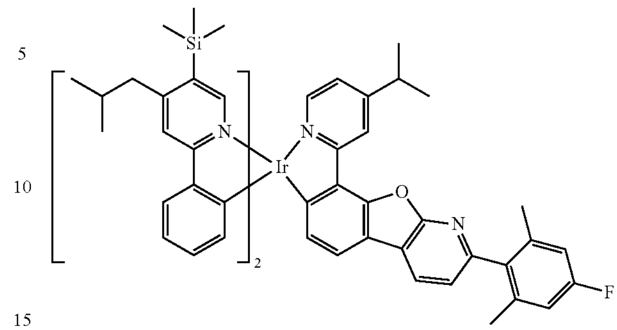
714
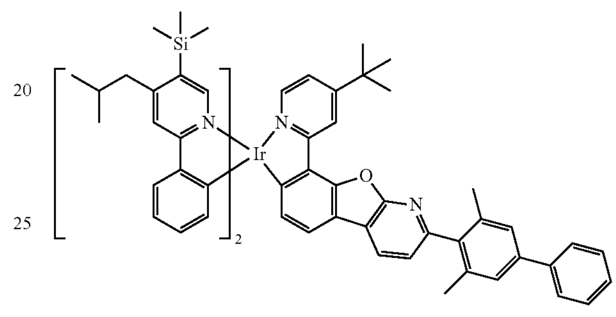
715
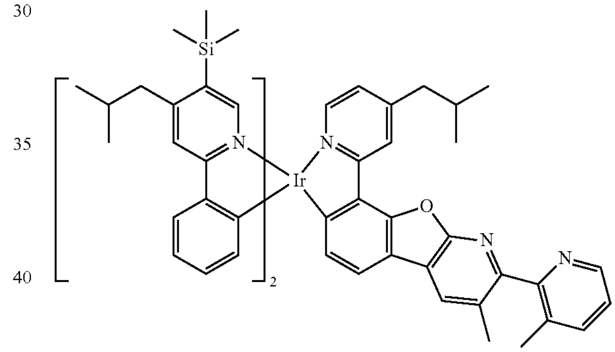
716
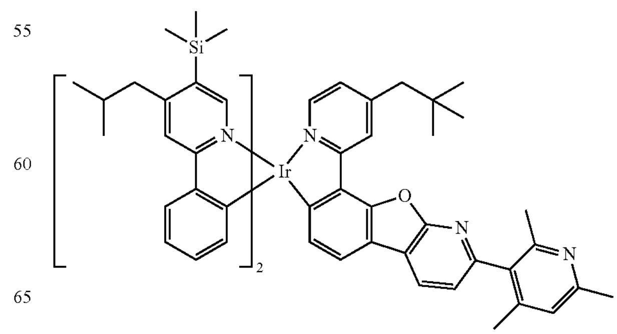

-continued
717
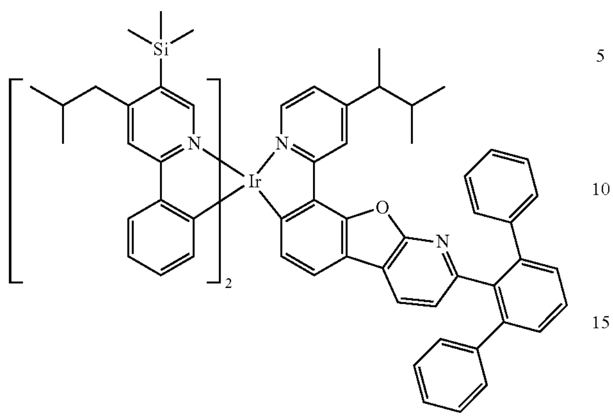
718
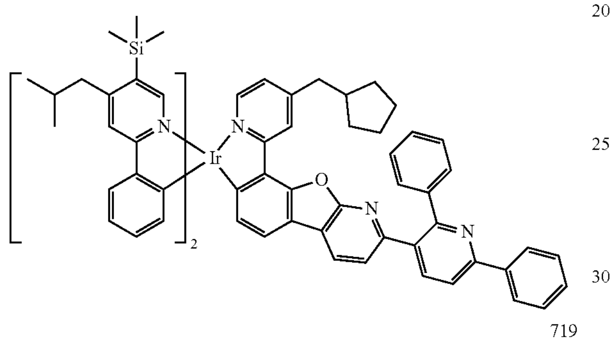
719
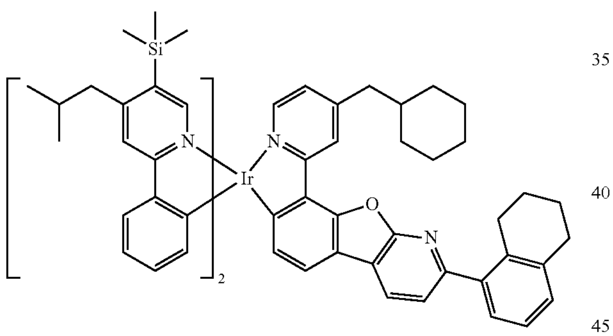
720
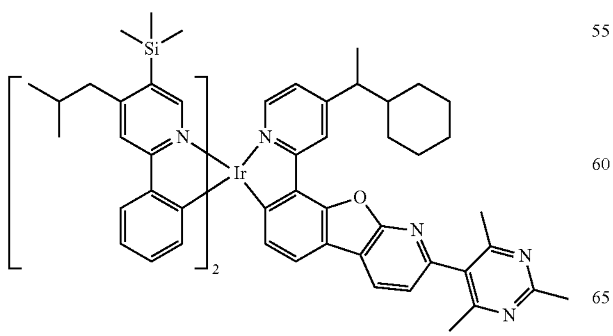
-continued
721
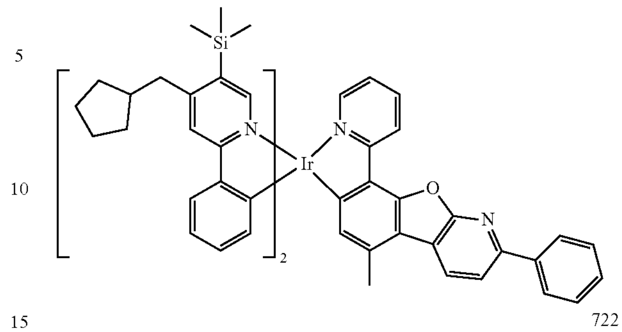
722
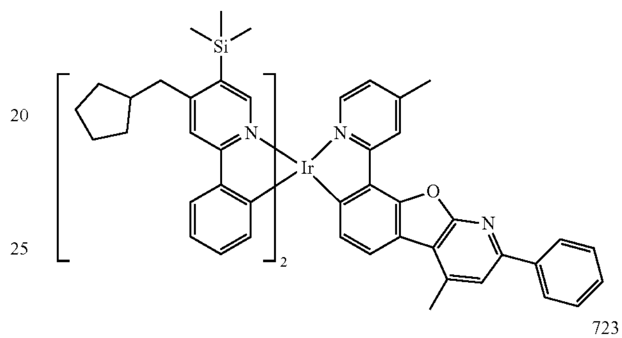
723
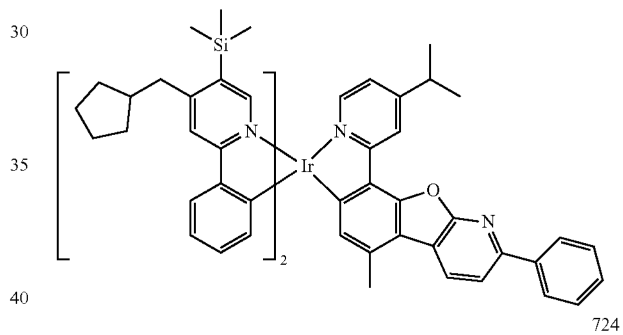
724
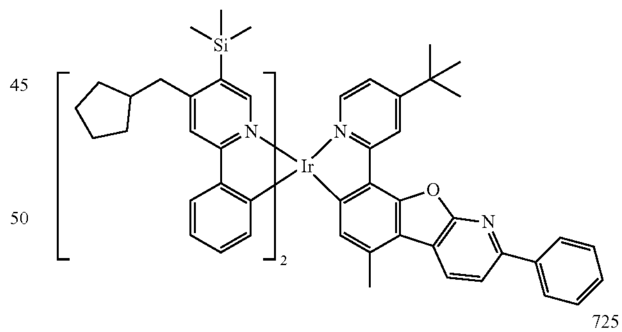
725
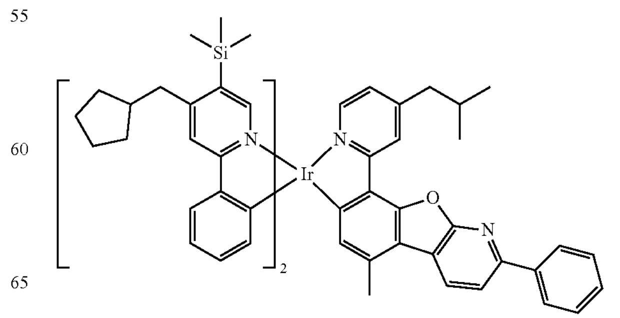

-continued
726
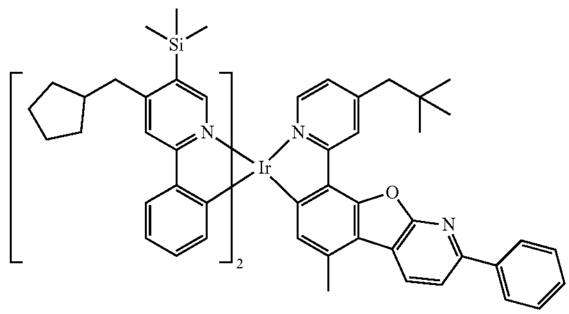
727
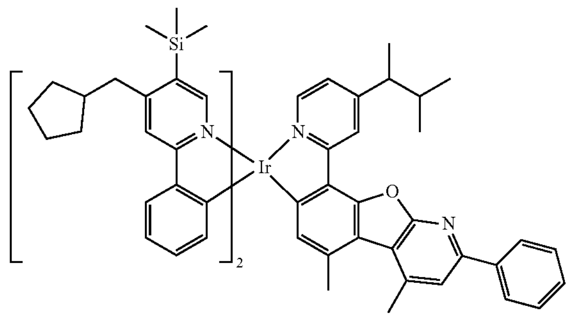
728
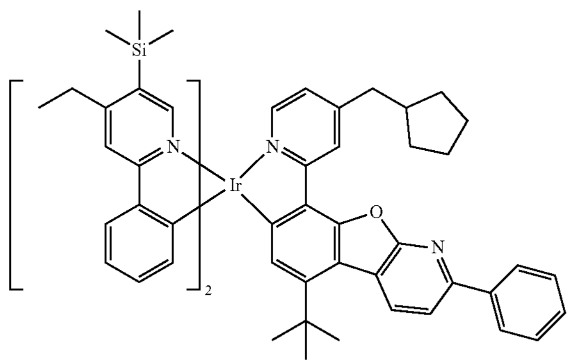
729
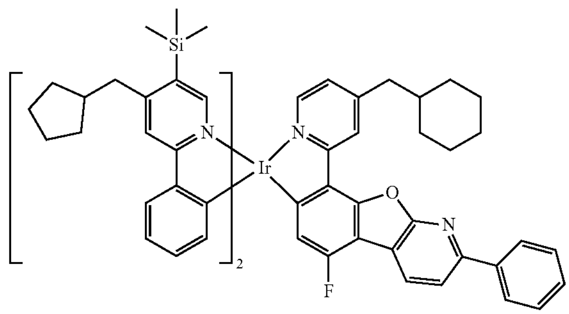
-continued
730
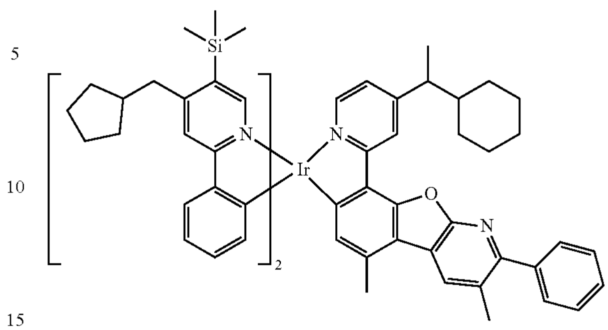
731
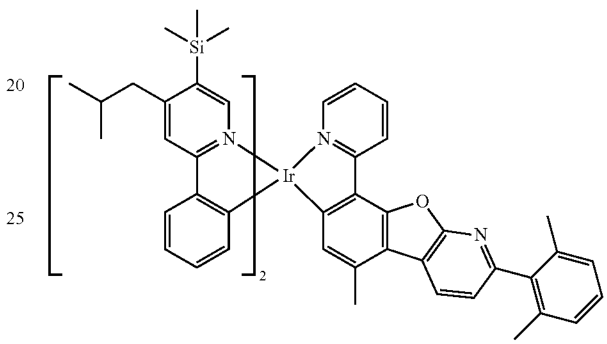
732
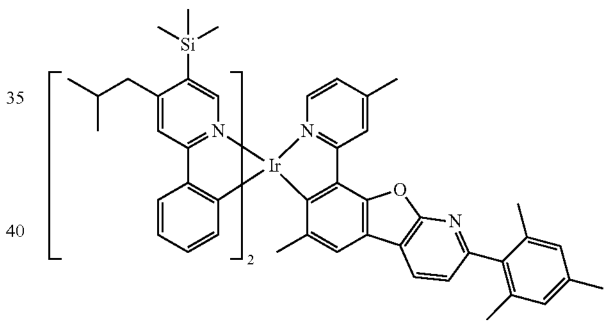
733
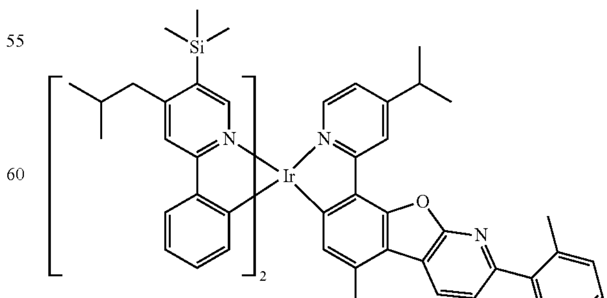

-continued
734
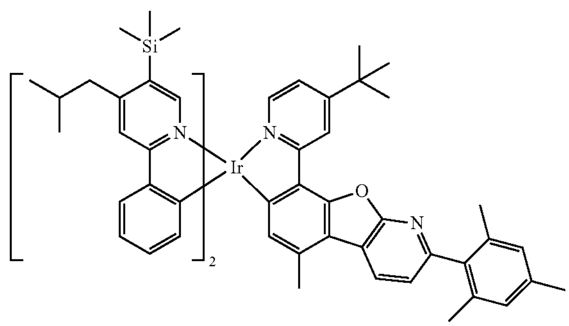
735
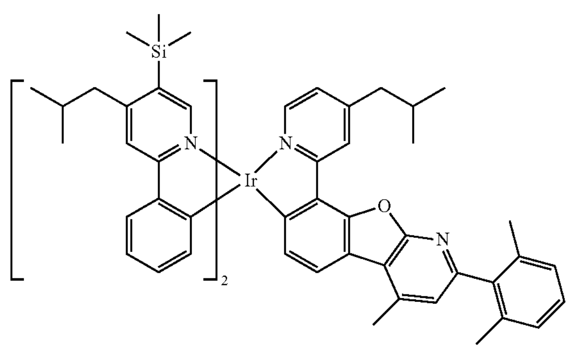
736
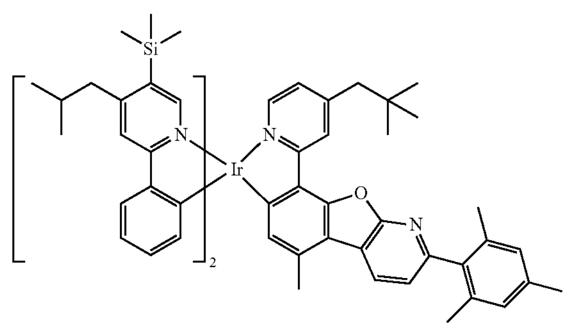
737
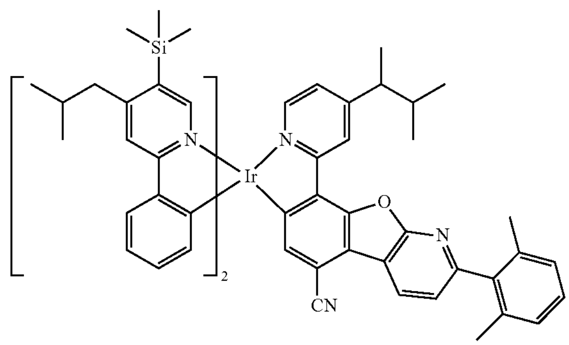
-continued
738
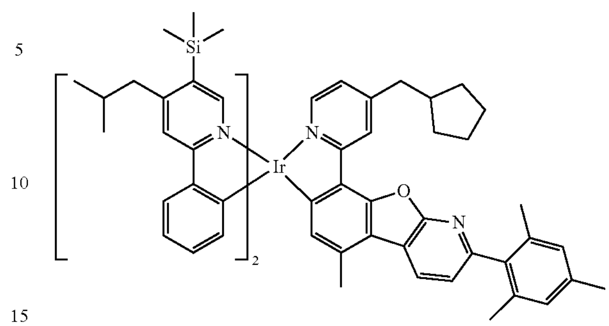
739
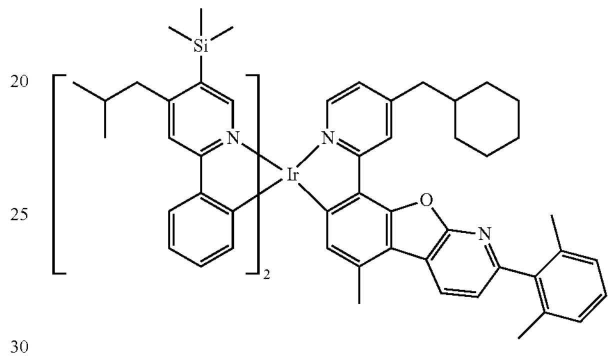
740
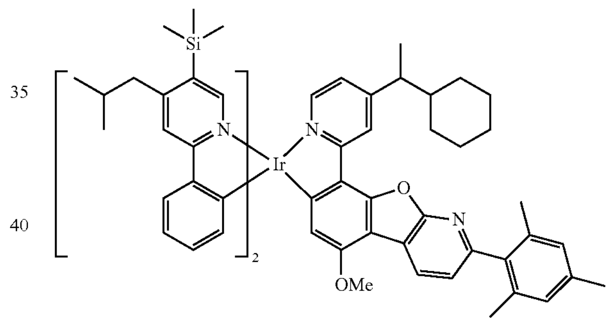
741
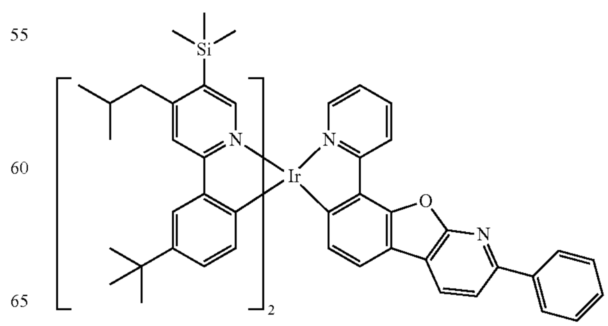

-continued
742
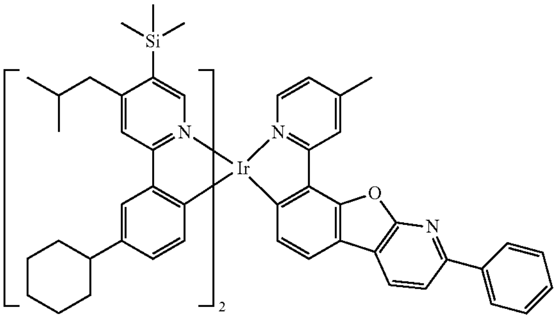
743
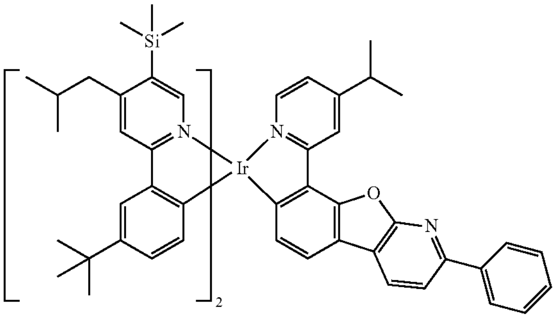
744
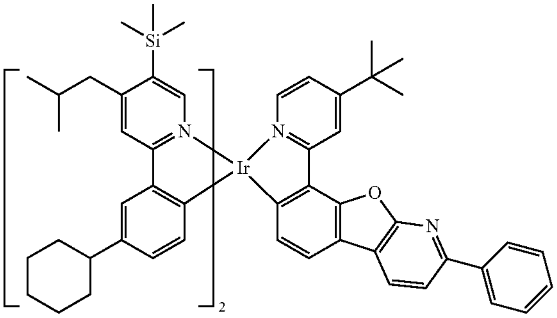
745
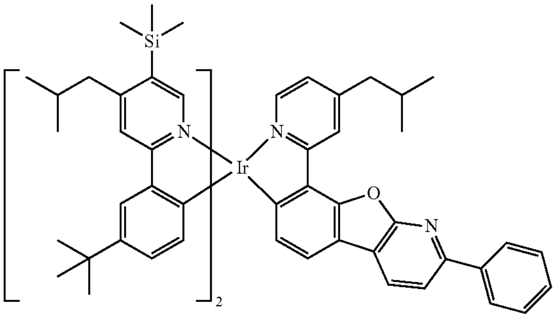
-continued
746
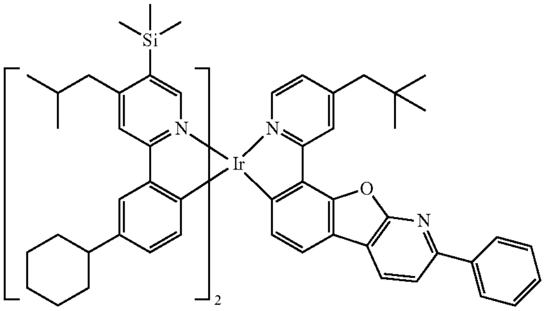
747
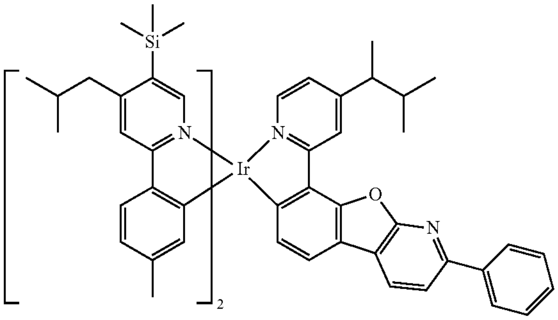
748
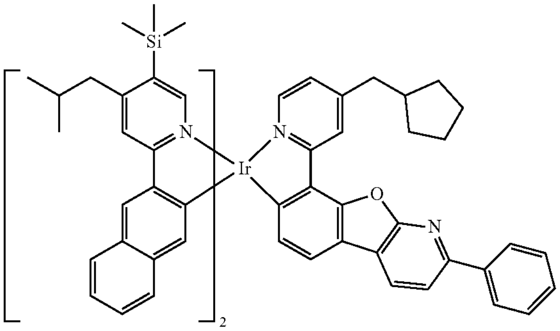
749
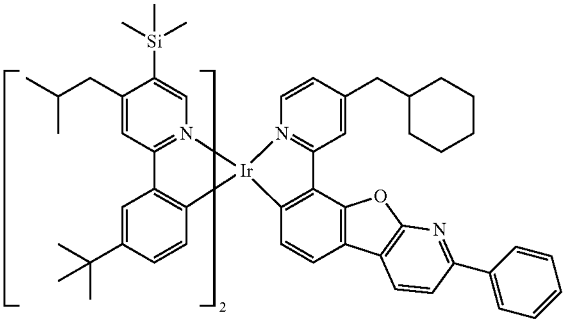

-continued
750
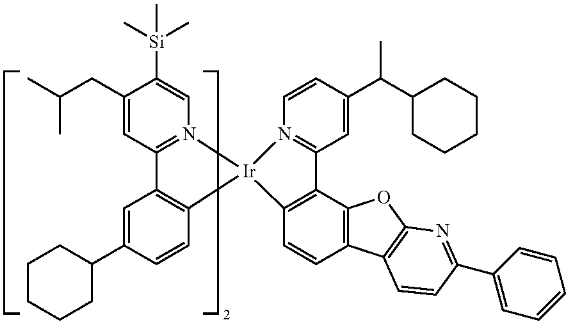
751
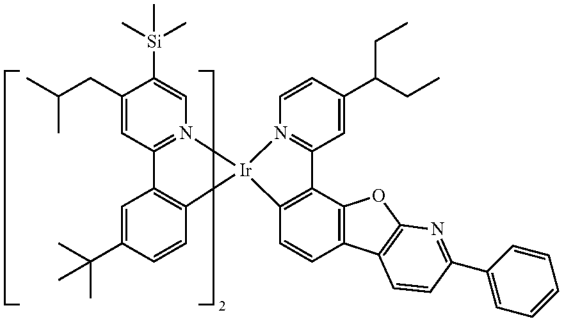
752
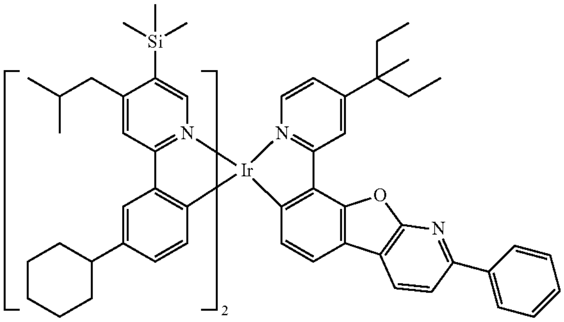
753
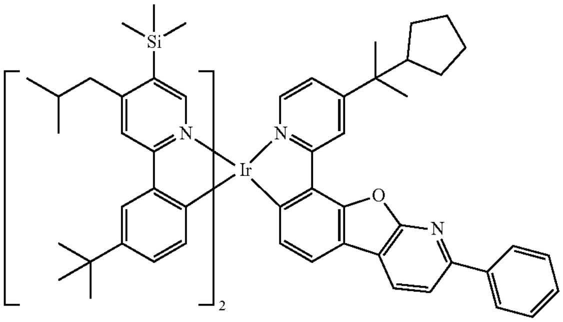
-continued
754
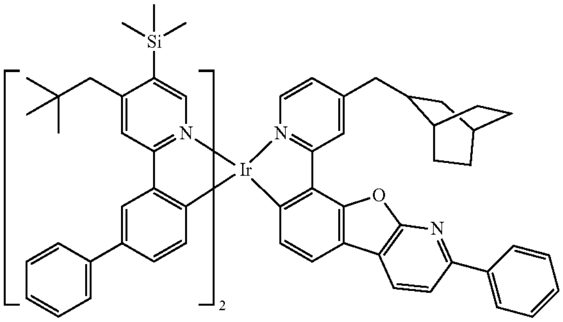
755
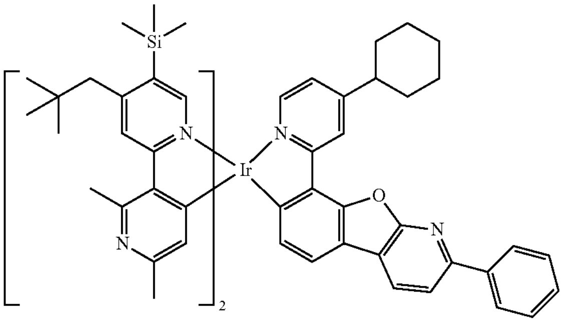
756
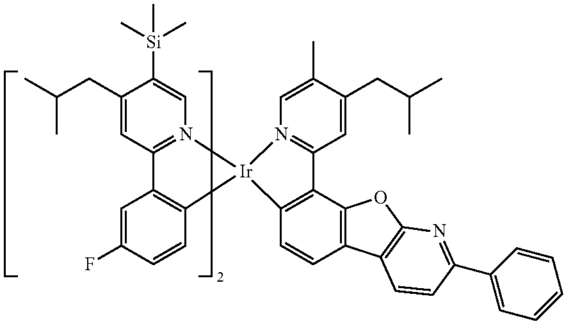
757
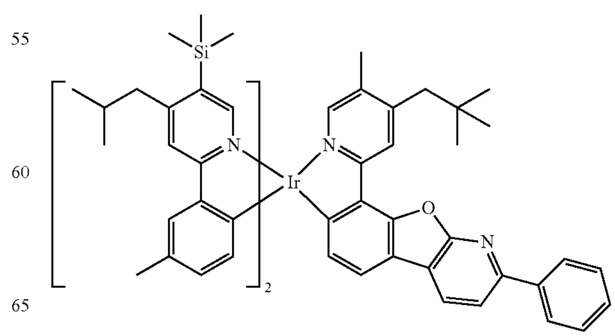

-continued
758
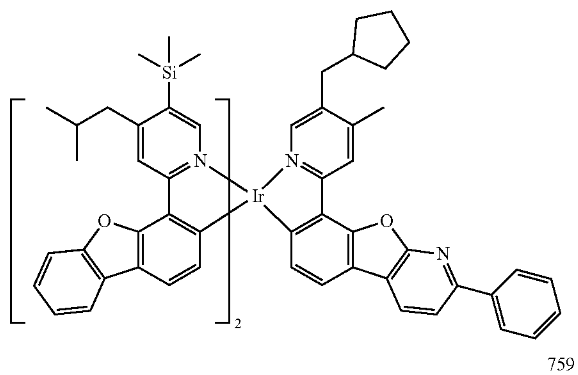
759
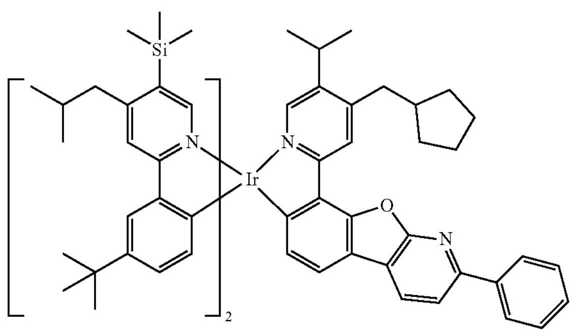
760
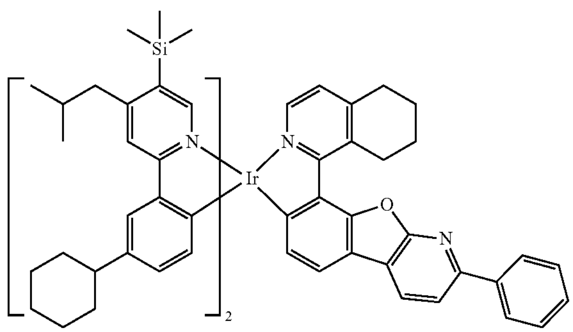
761
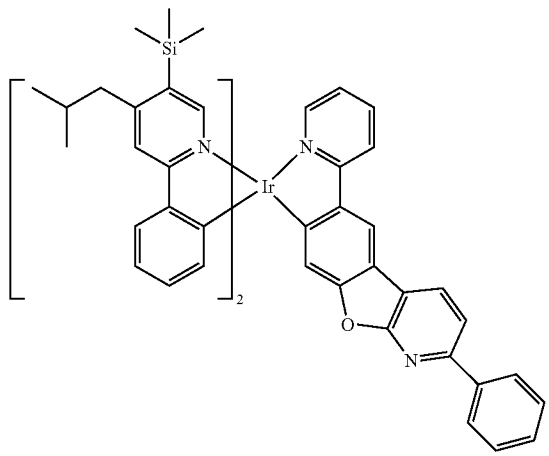
-continued
762
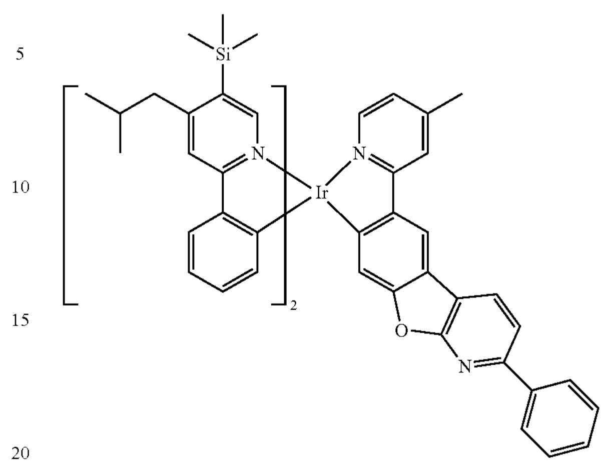
763
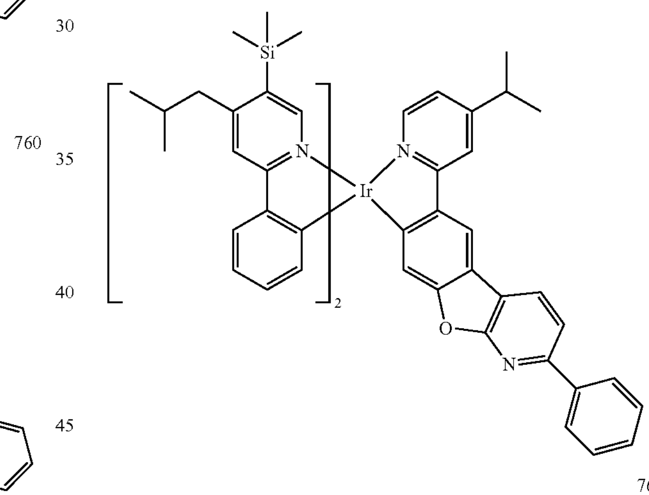
764
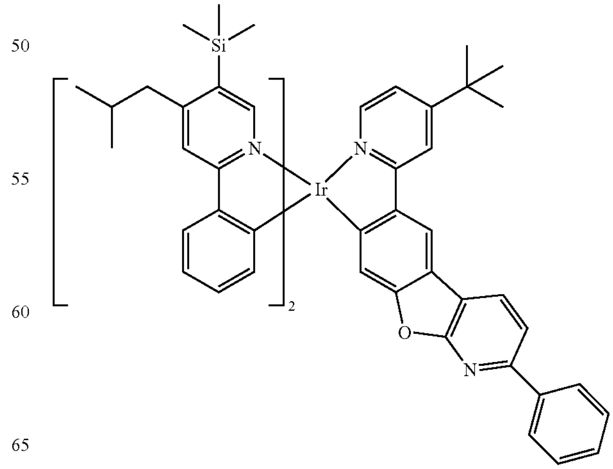

-continued
765
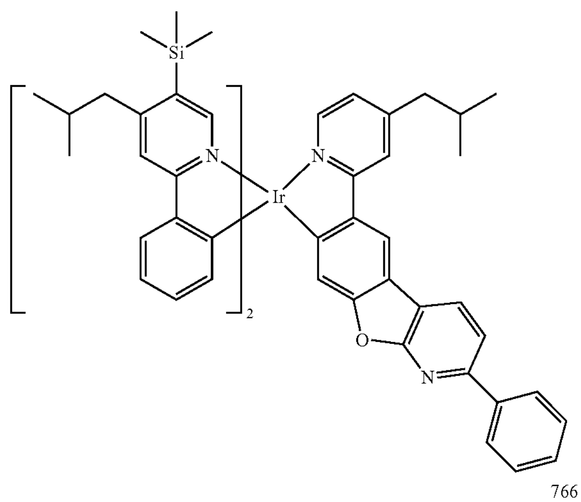
766
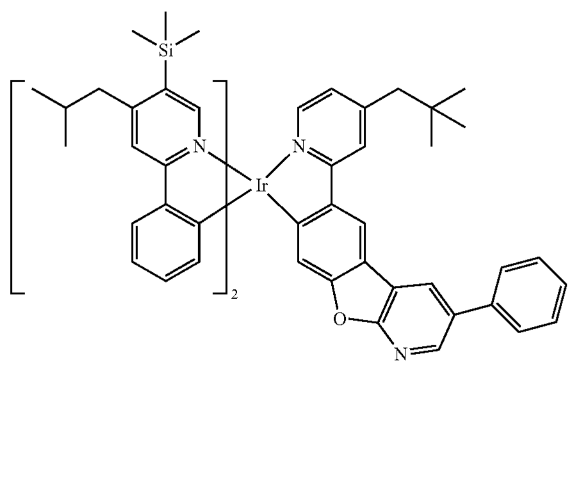
767
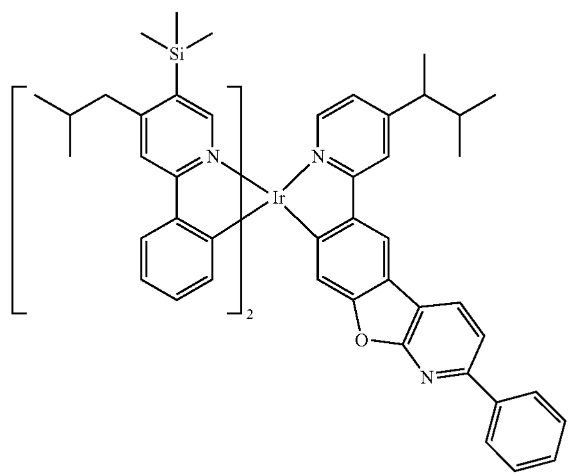
-continued
768
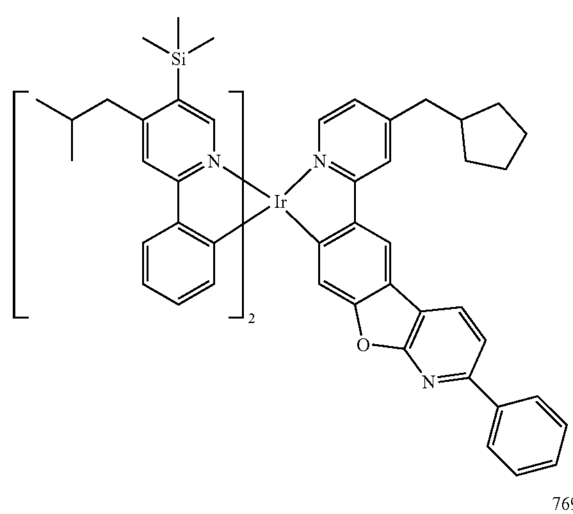
769
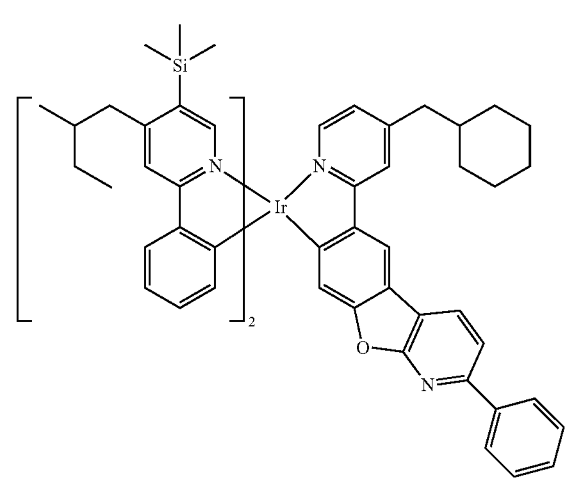
770
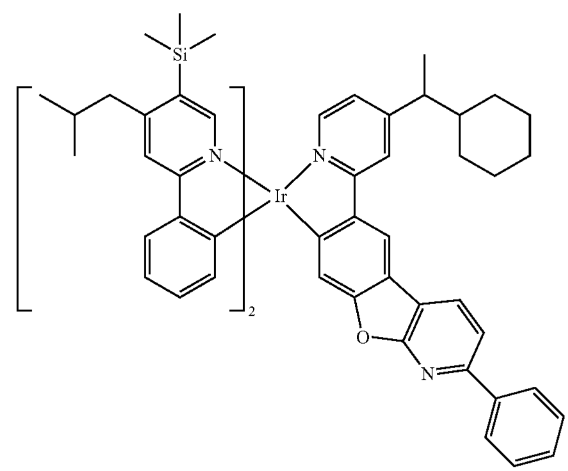

-continued
771
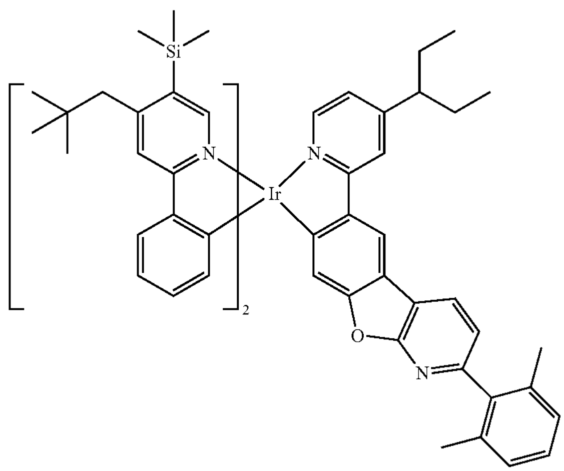
772
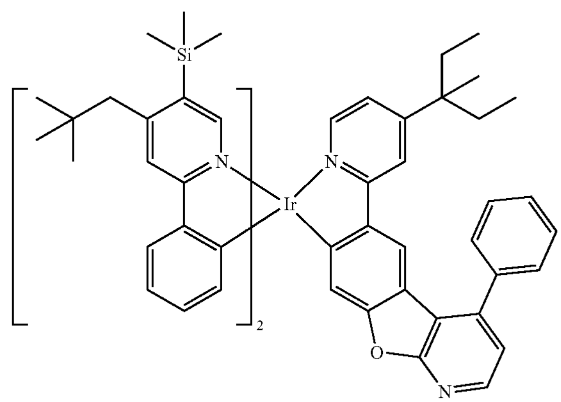
773
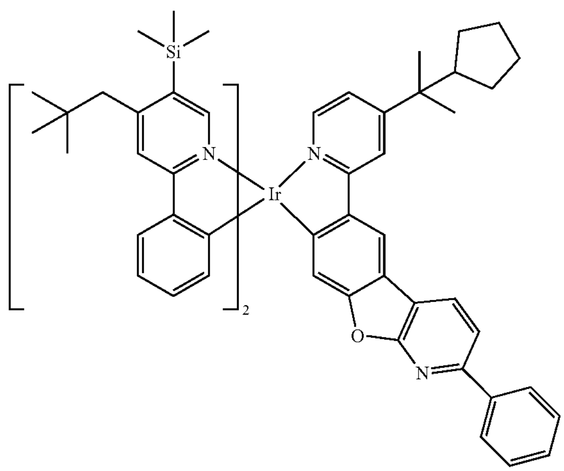
-continued
774
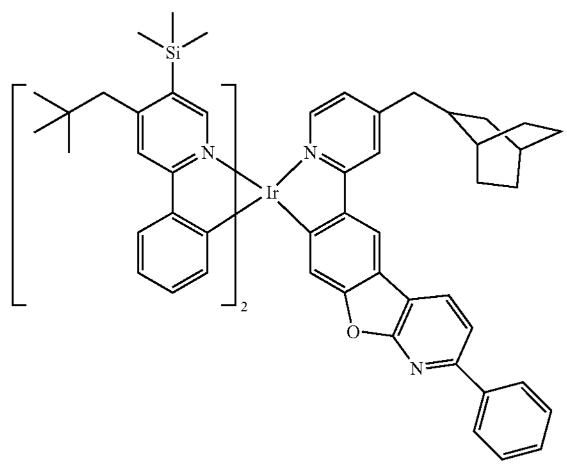
775
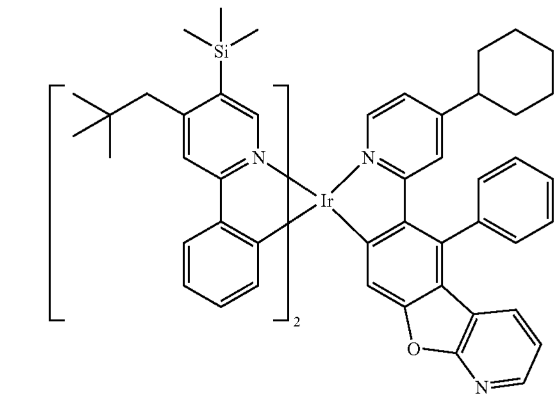
776
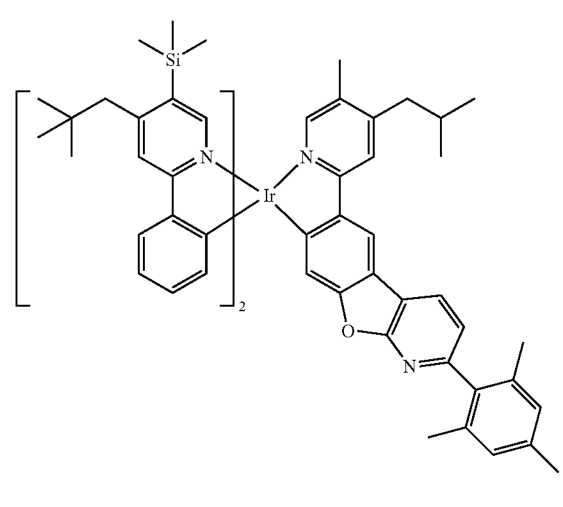

-continued
777
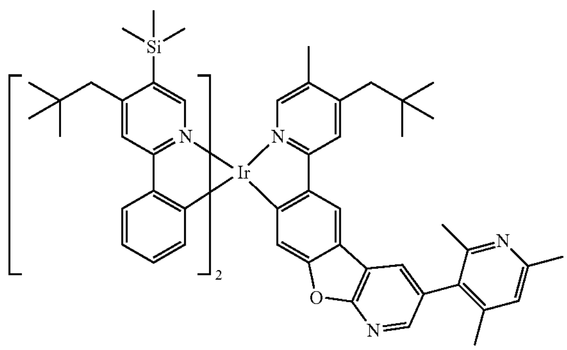
778
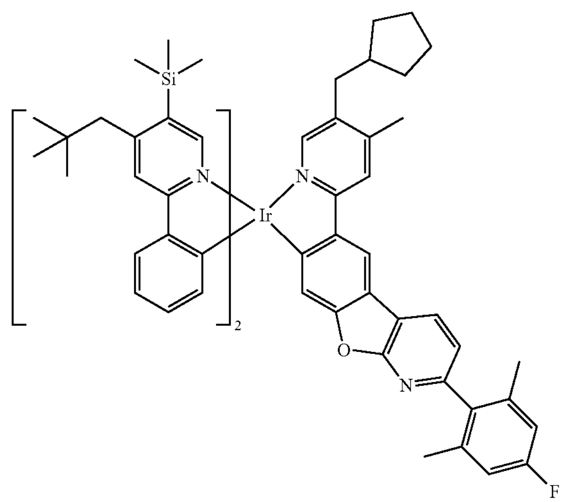
779
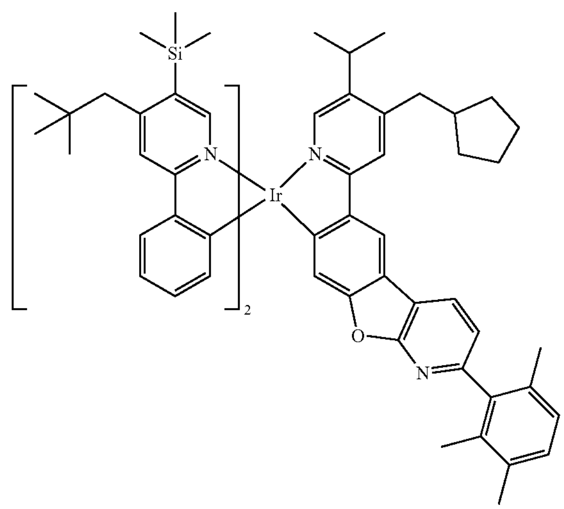
-continued
780
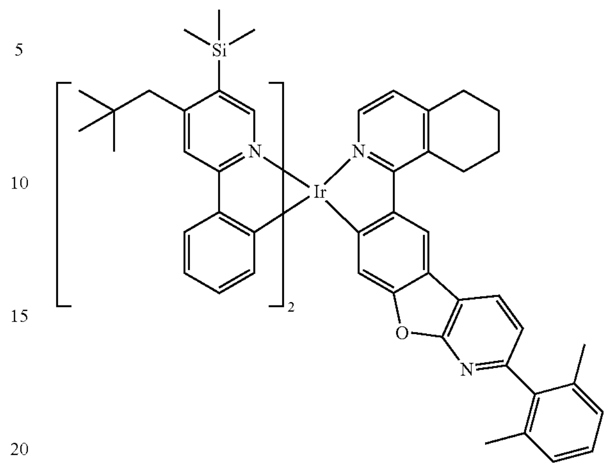
781
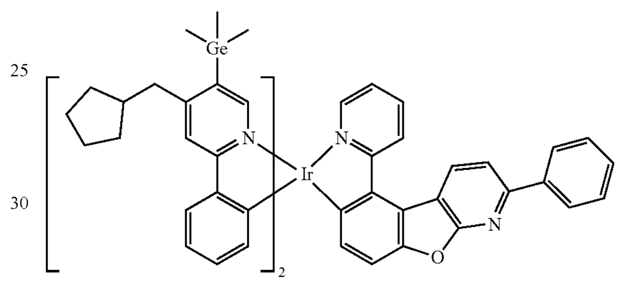
782
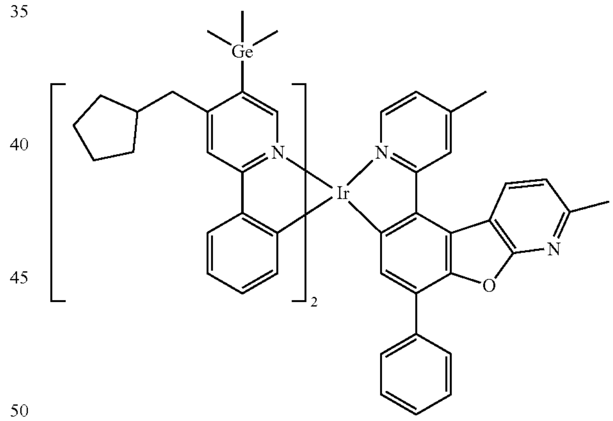
783
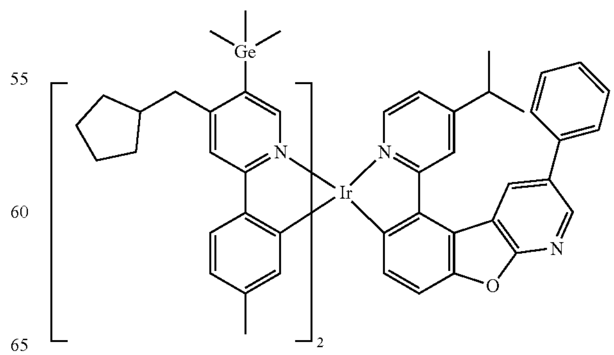

-continued
784
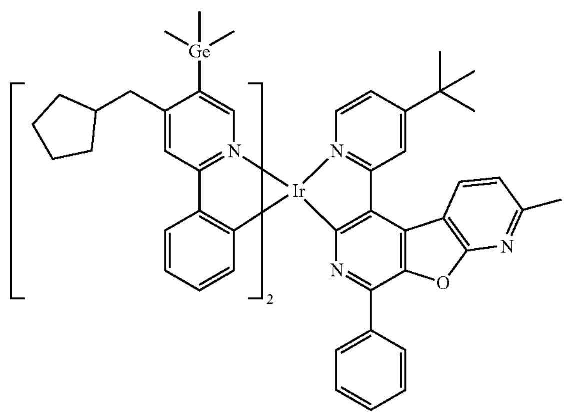
785
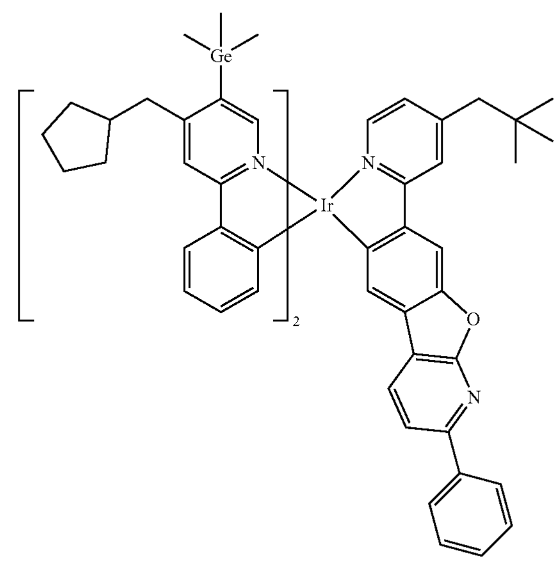
786
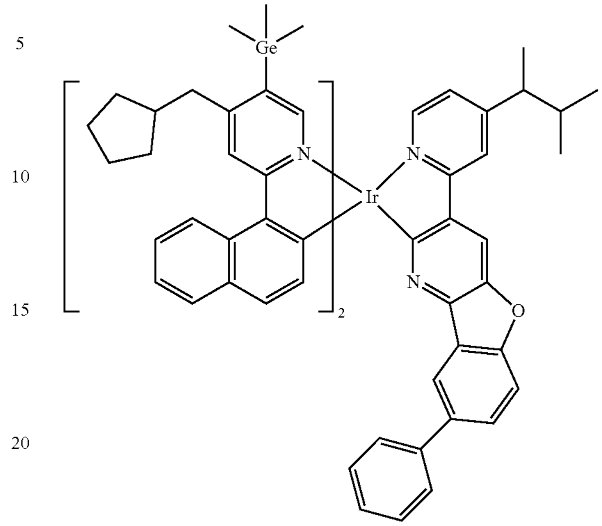
-continued
787
788
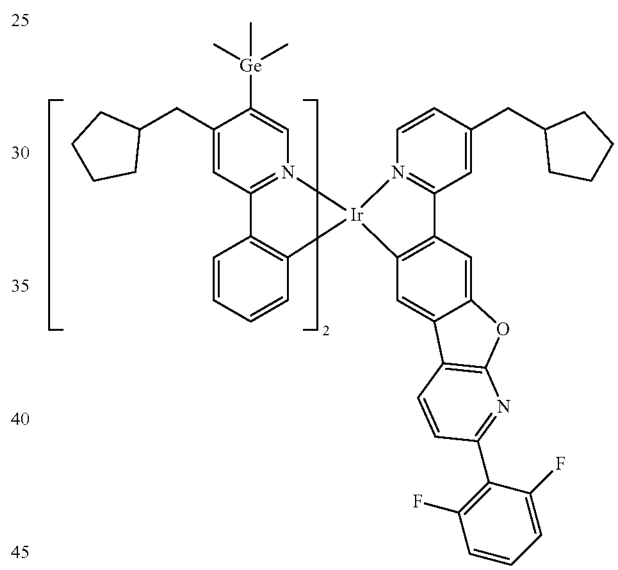
789
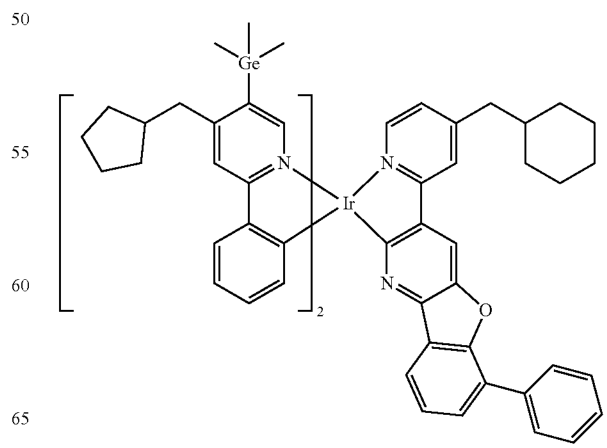

790
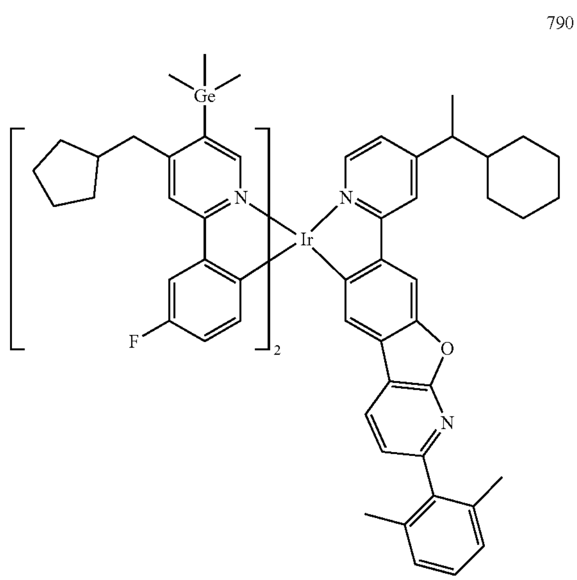
791
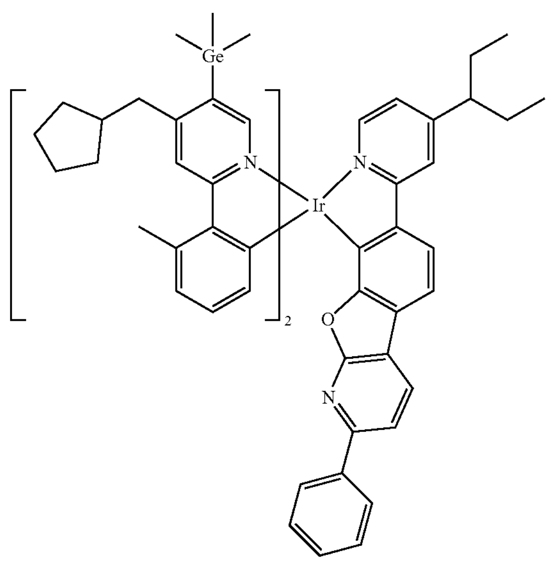
792
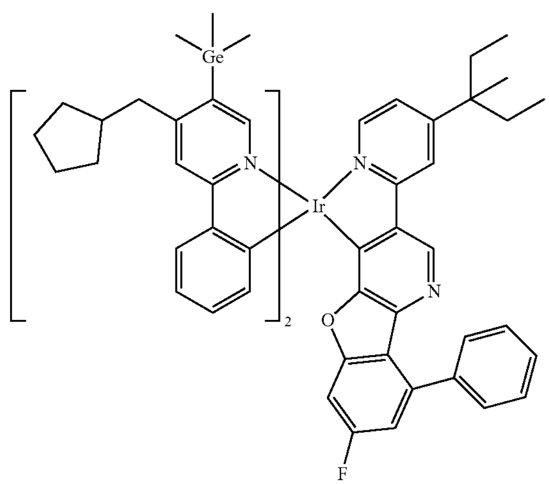
793
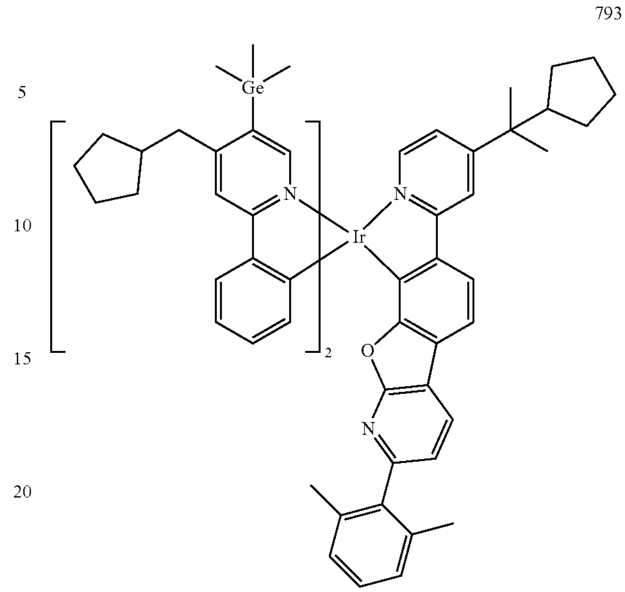
794
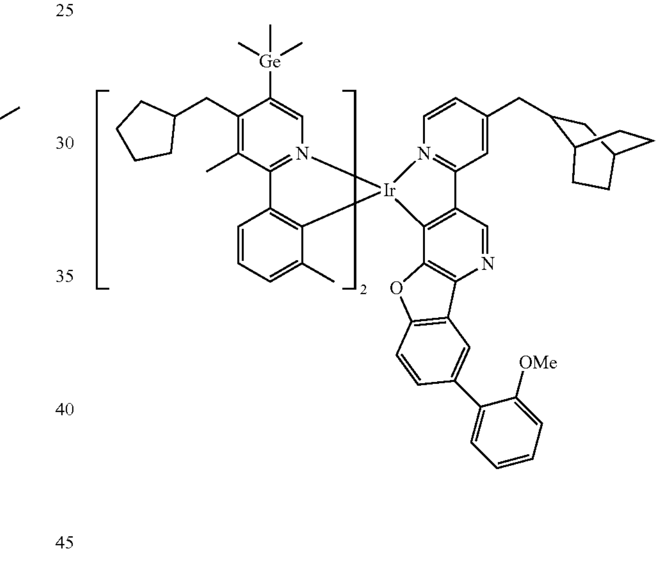
795
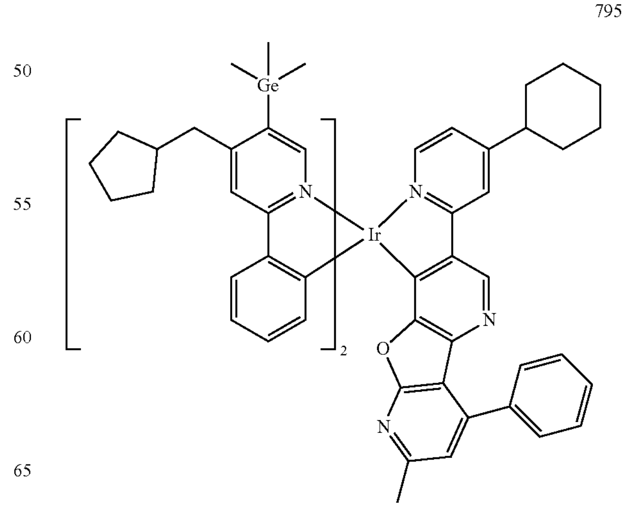

796
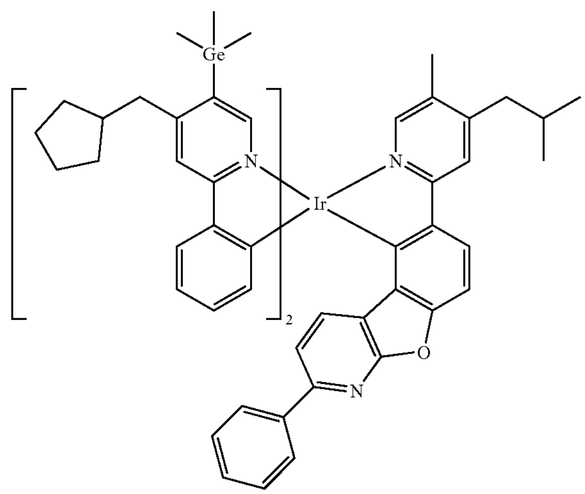
797
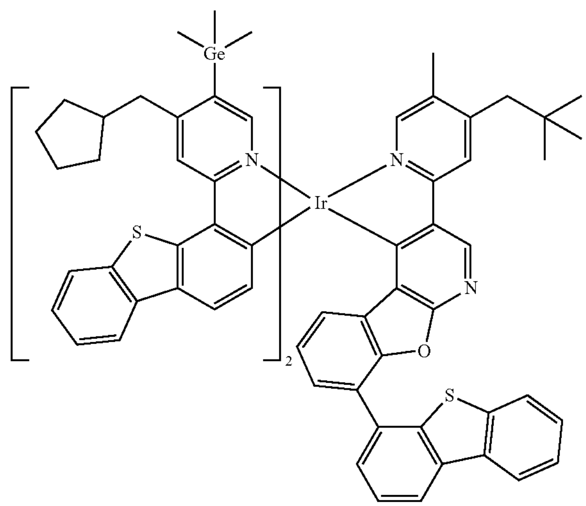
798
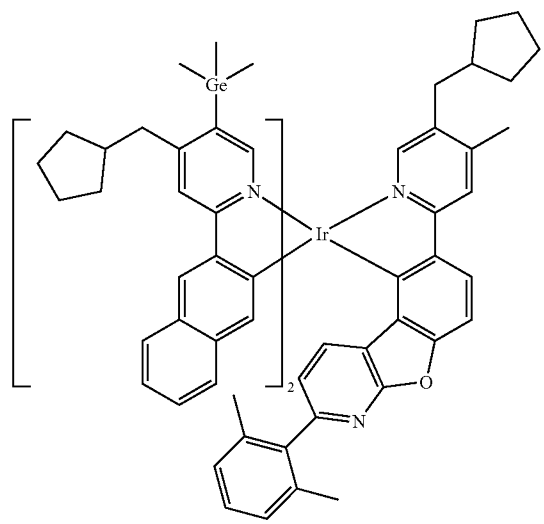
799
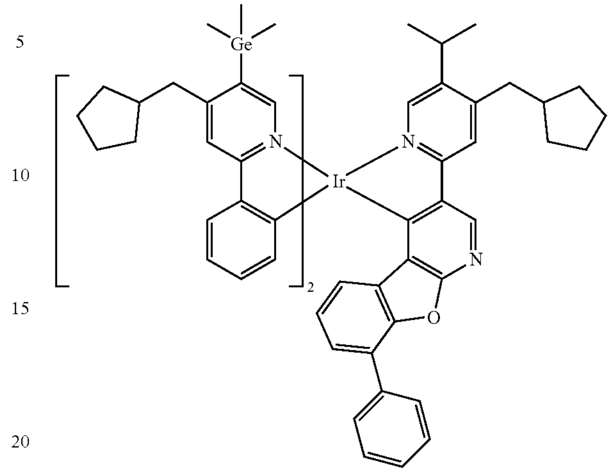
800
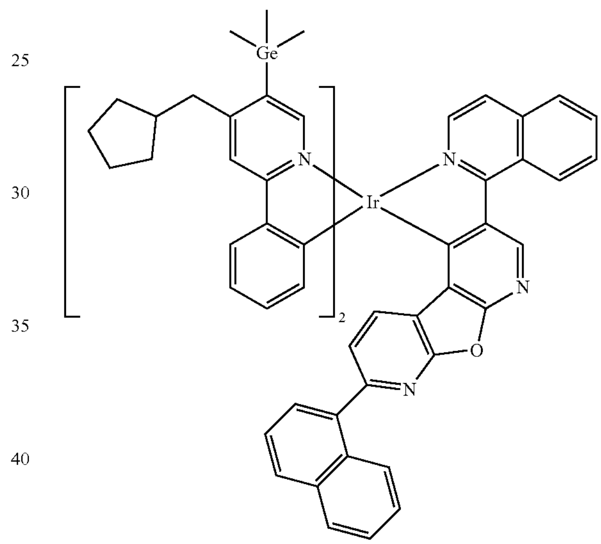
801
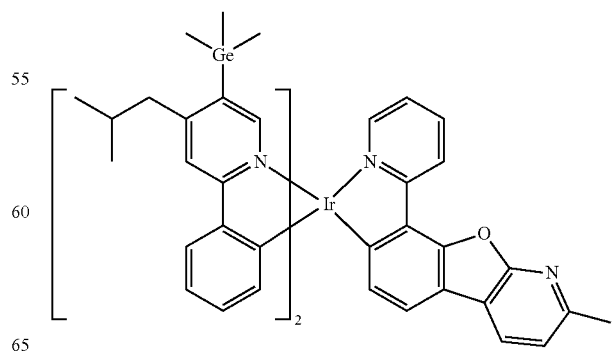

-continued
802
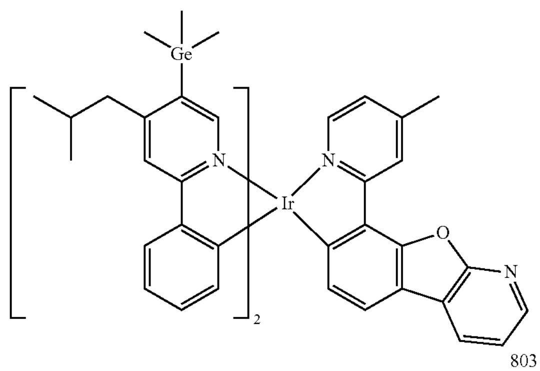
803
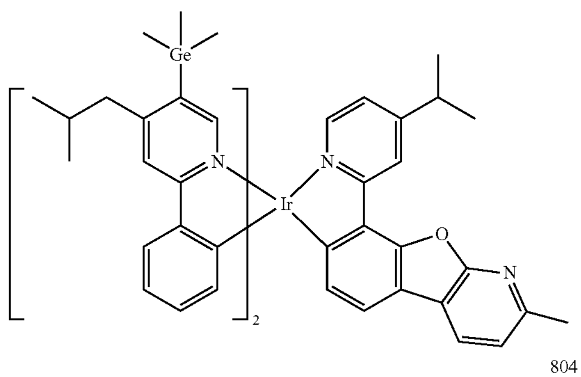
804
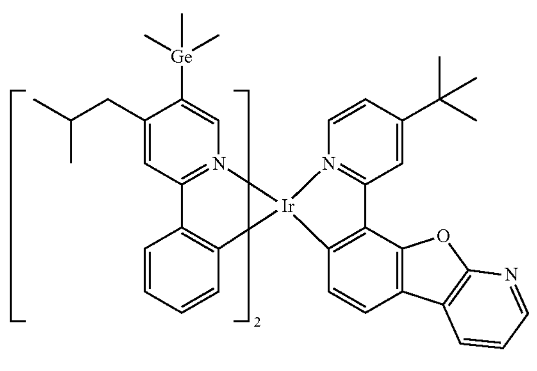
805
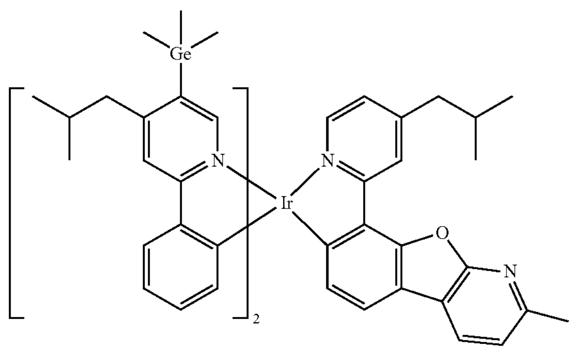
-continued
806
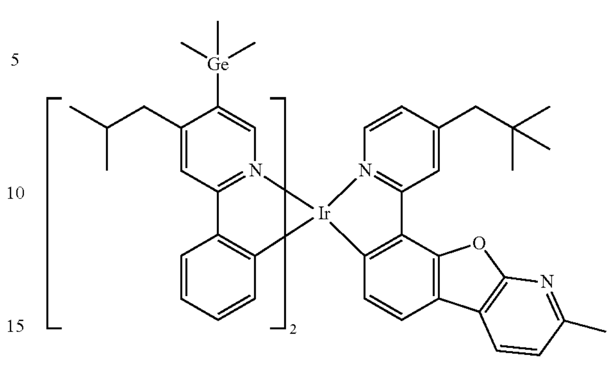
807
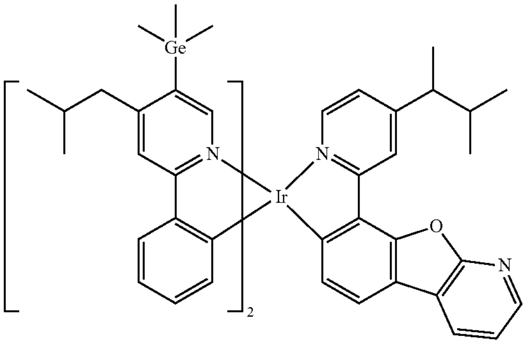
808
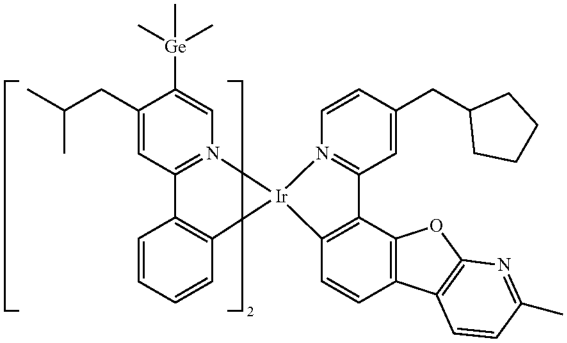
809
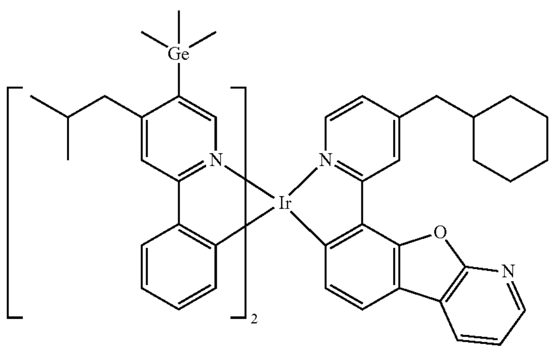

-continued
810
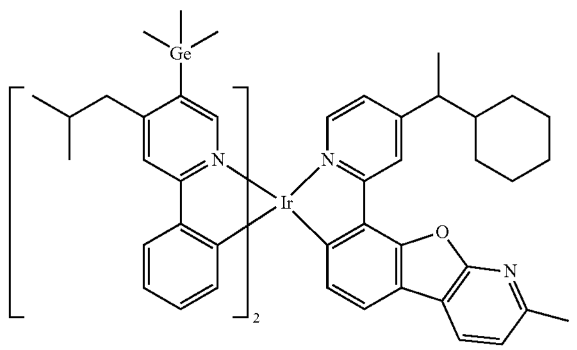
811
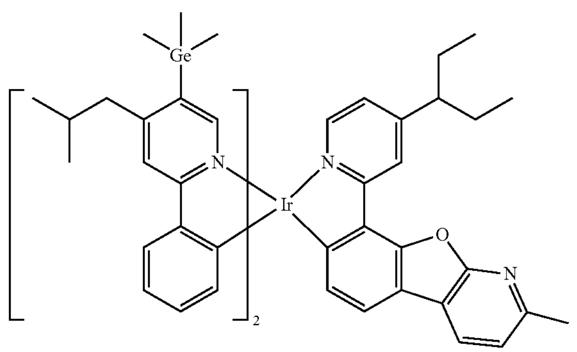
812
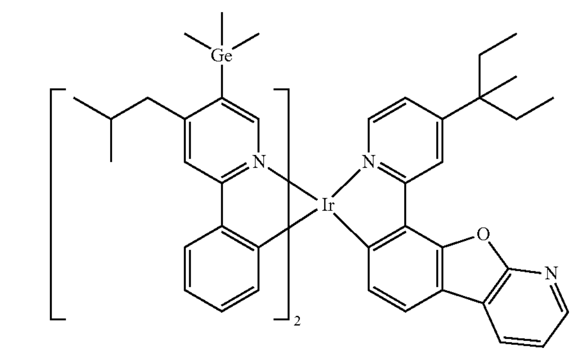
813
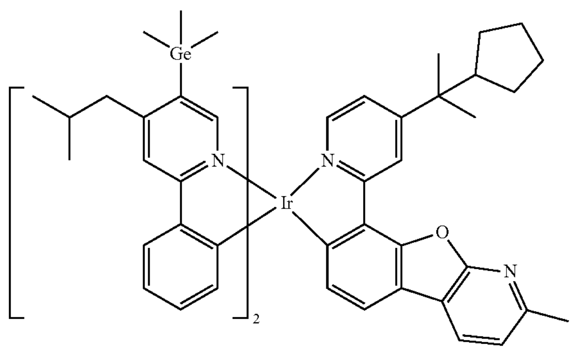
-continued
814
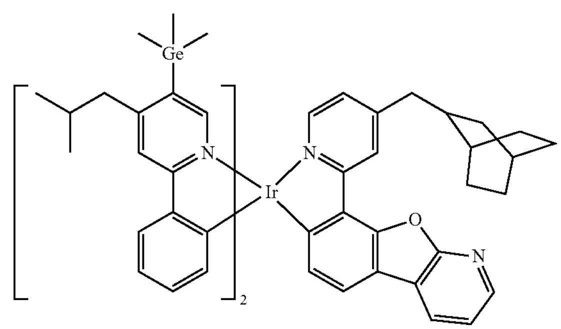
815
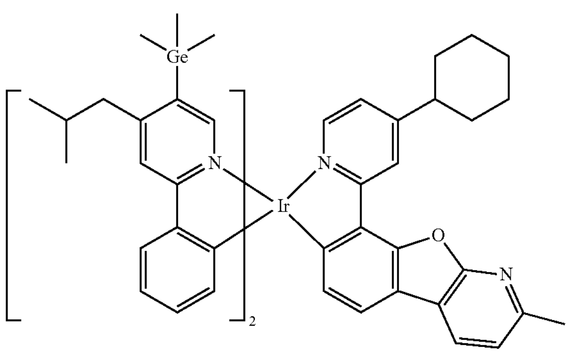
816
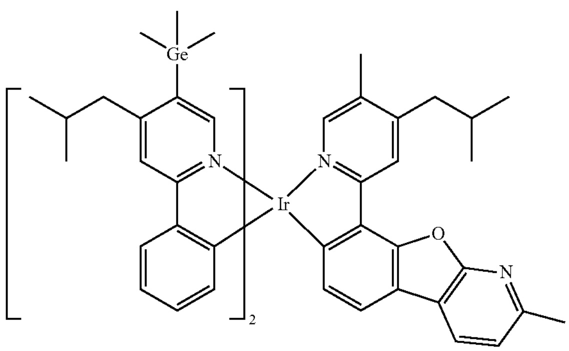
817
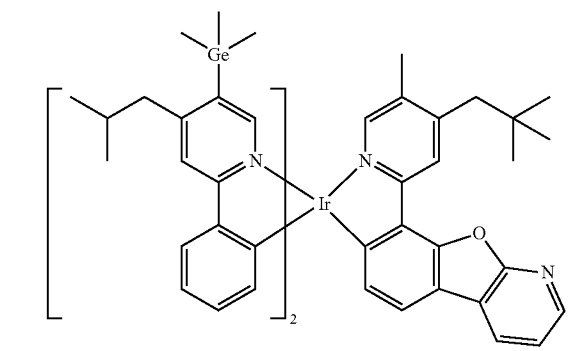

-continued
818
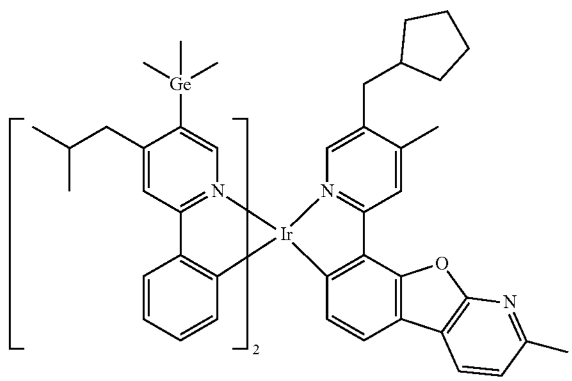
819
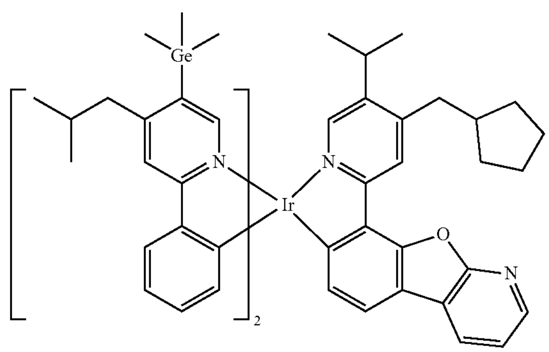
820
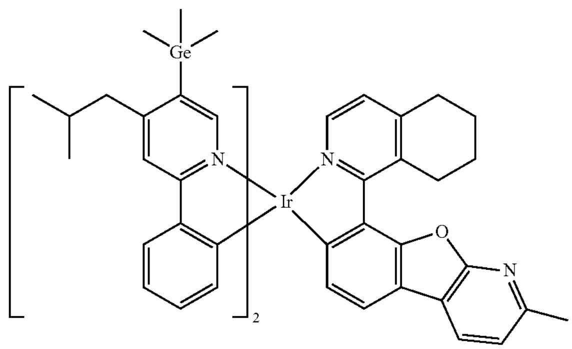
821
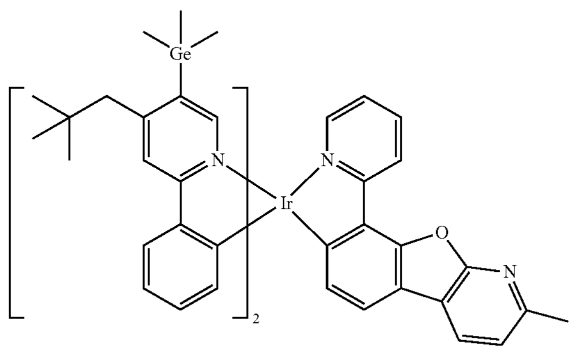
-continued
822
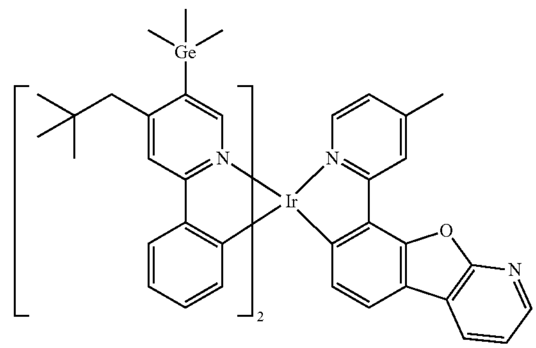
823
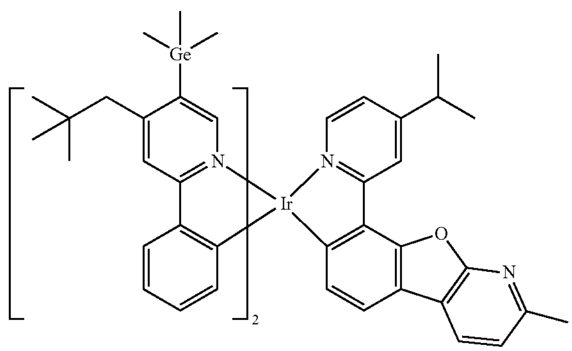
824
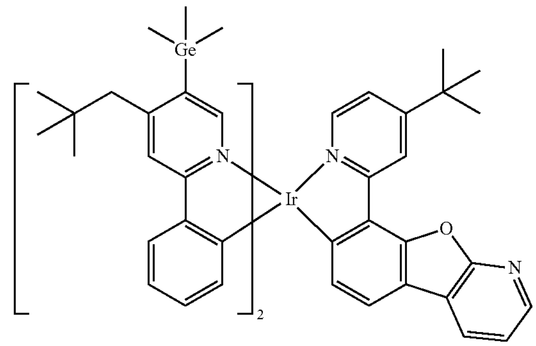
825
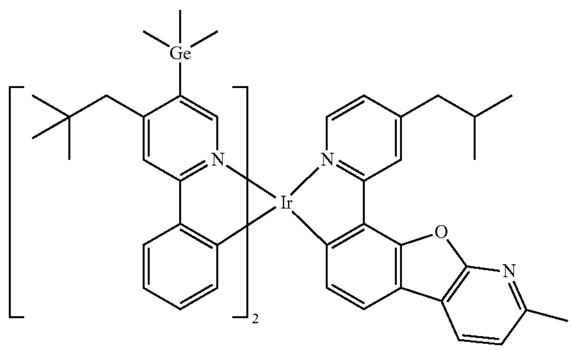

-continued
826
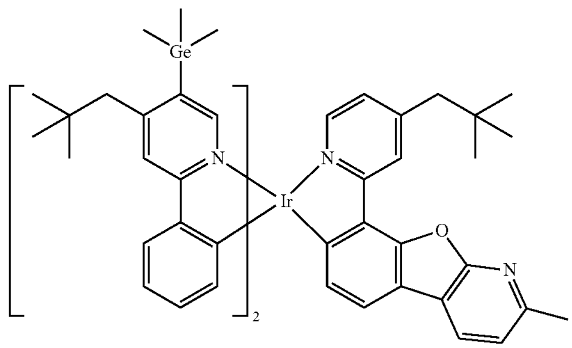
827
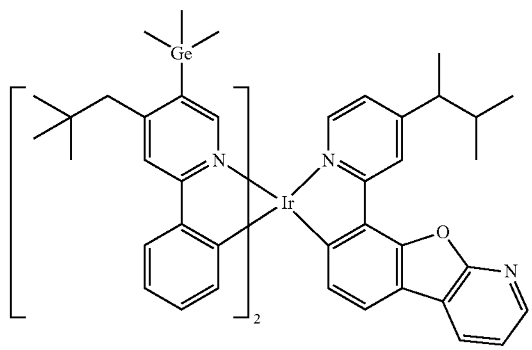
828
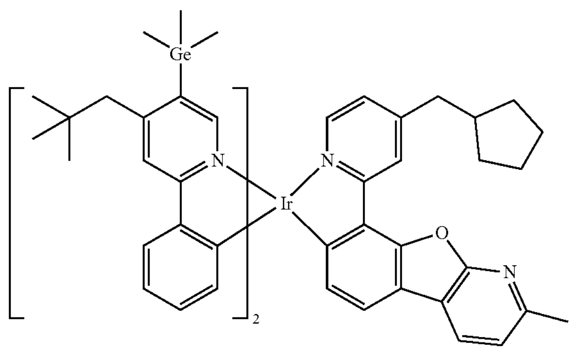
829
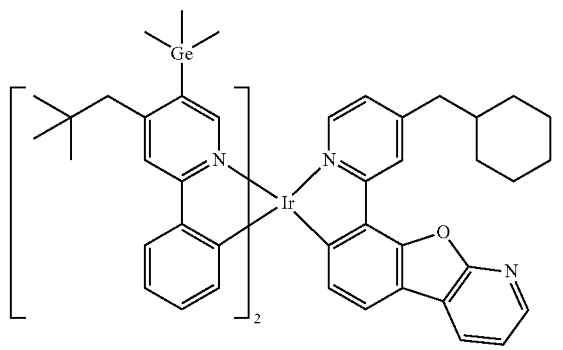
-continued
830
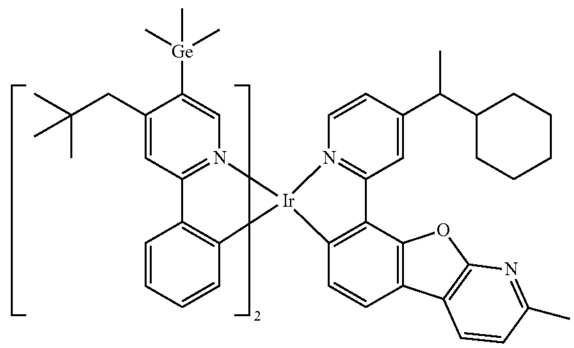
831
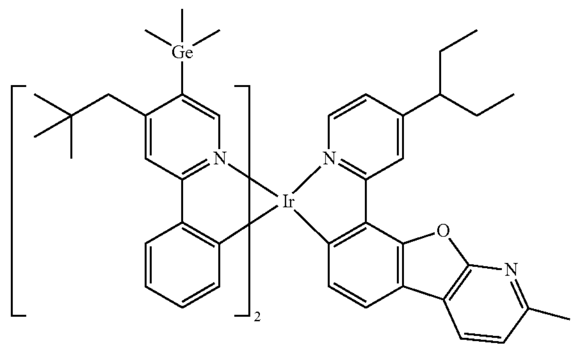
832
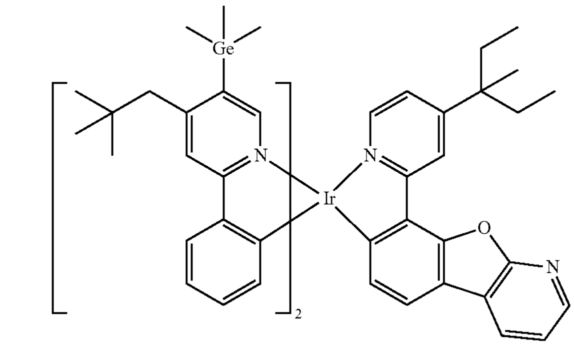
833
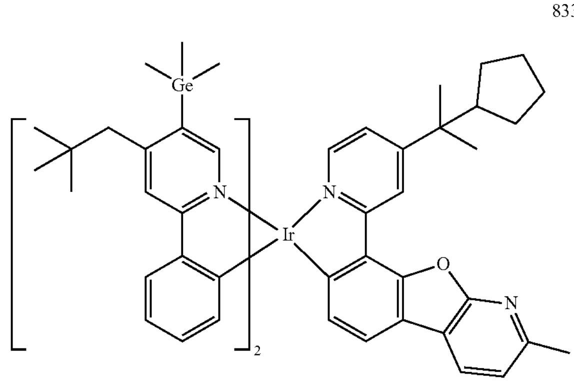

834
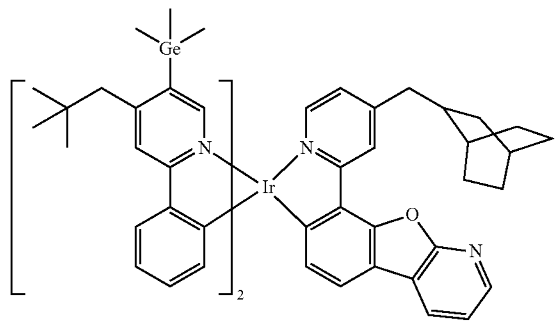
835
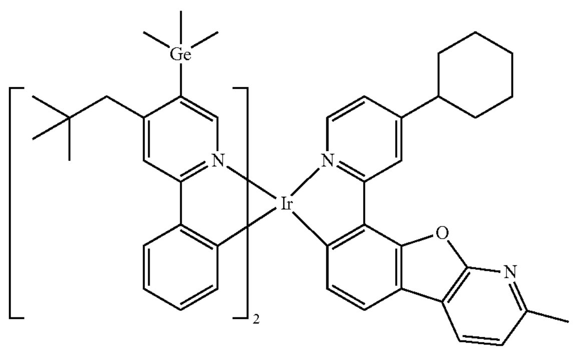
836
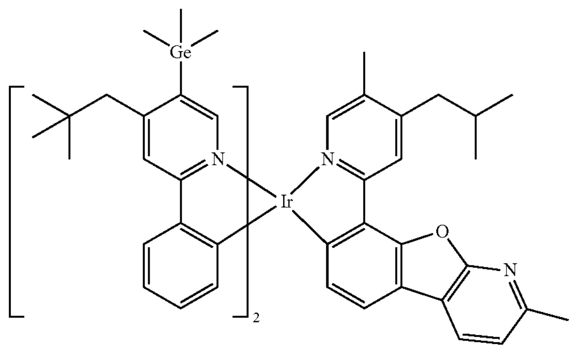
837
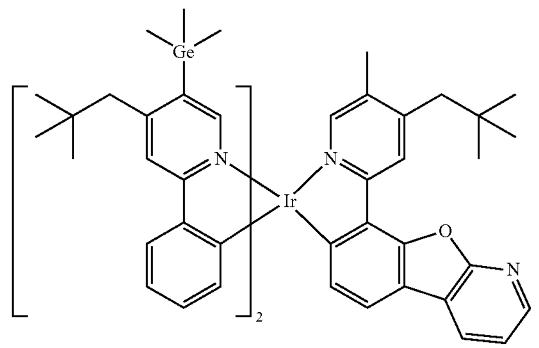
838
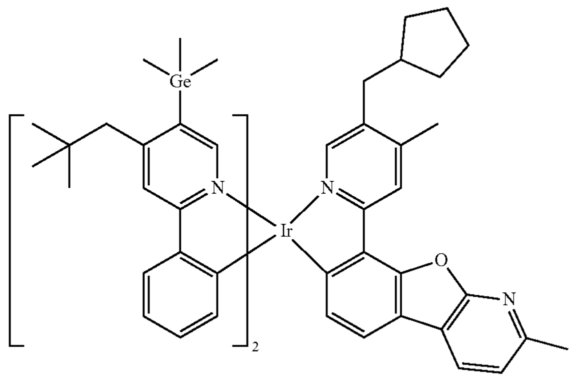
839
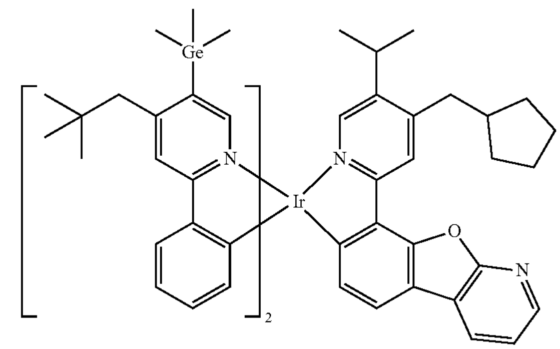
840
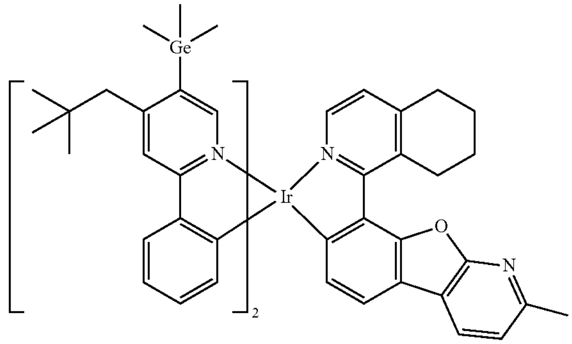
841
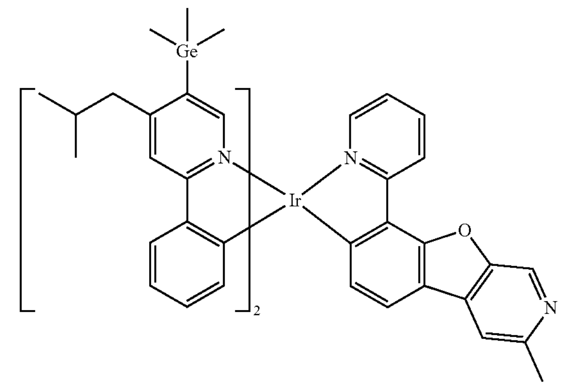

-continued
842
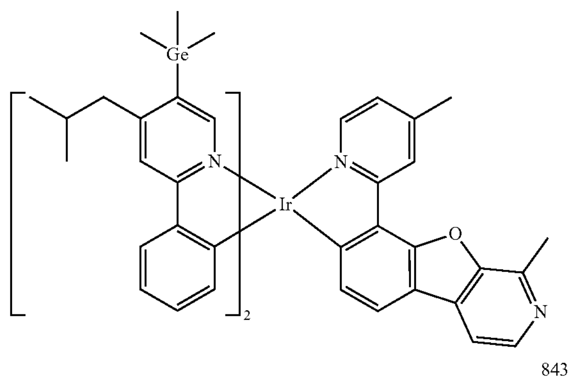
843
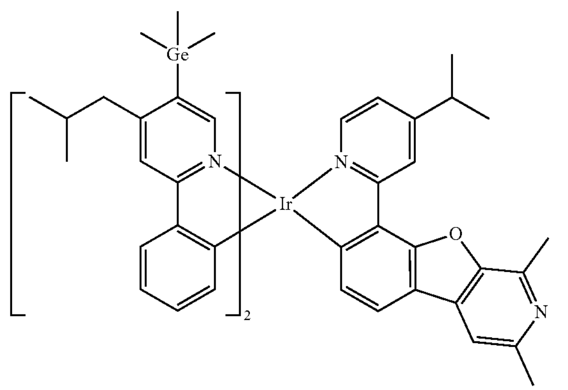
844
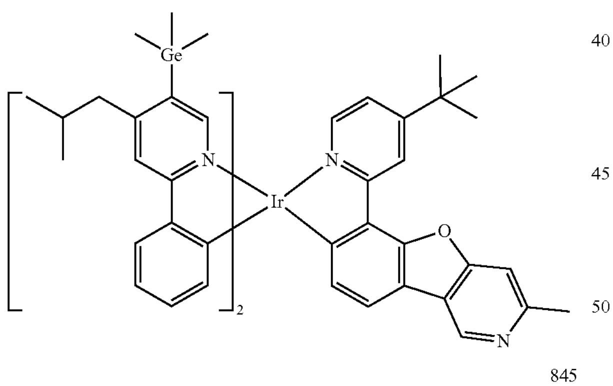
845
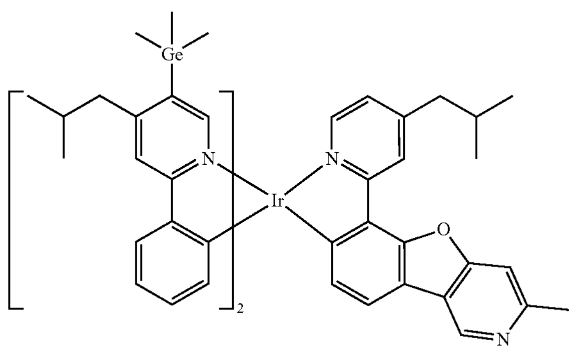
-continued
846
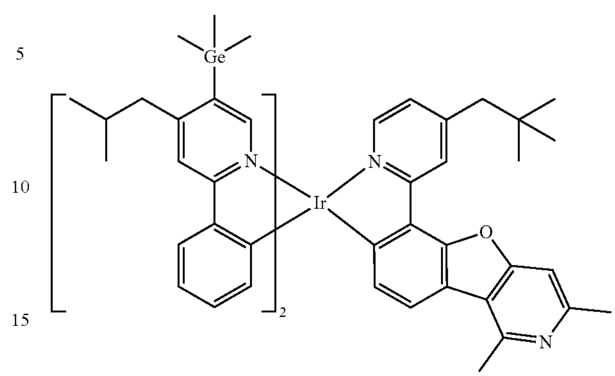
847
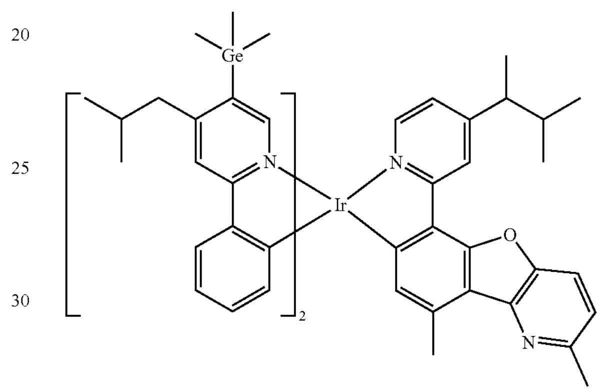
848
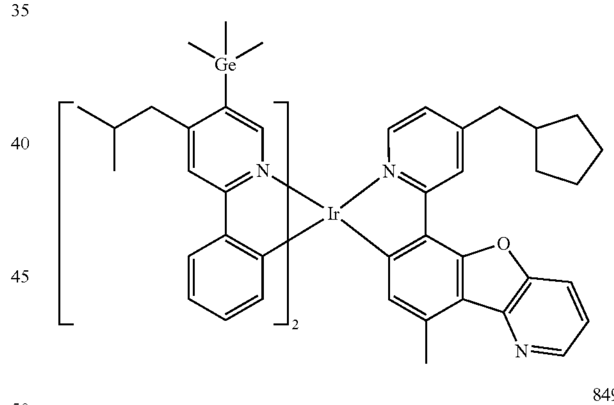
849
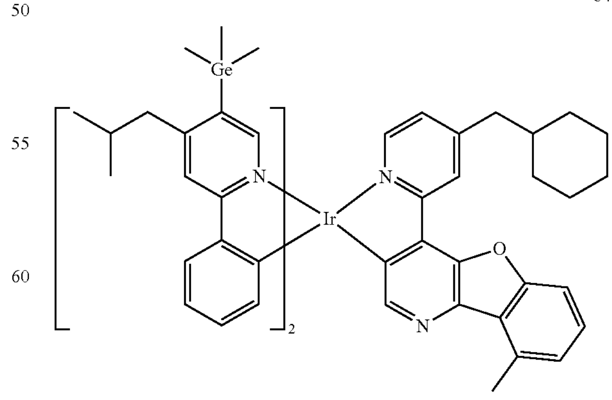

850
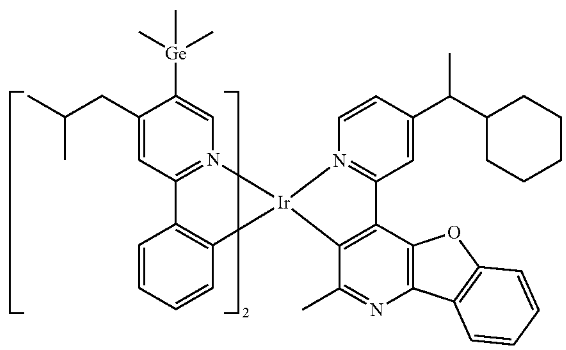
851
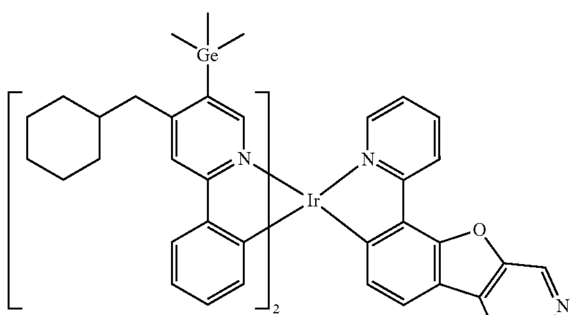
852
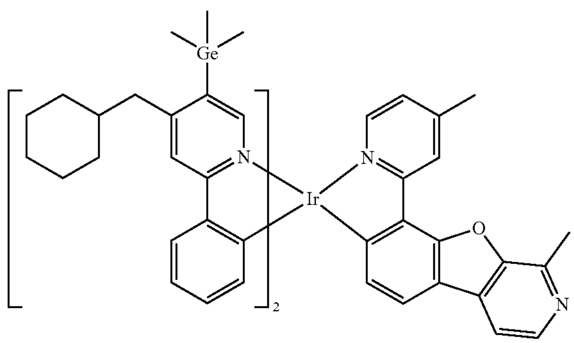
853
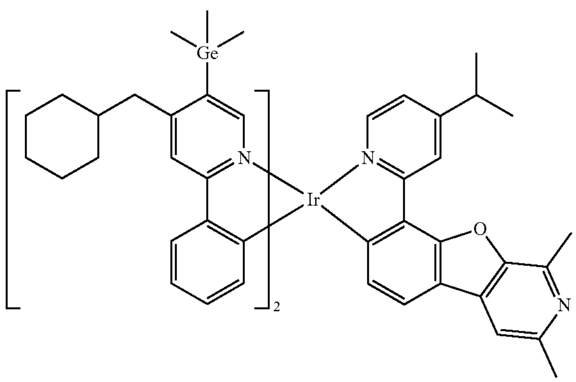
854
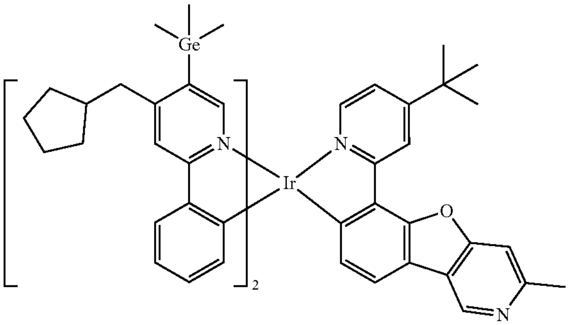
855
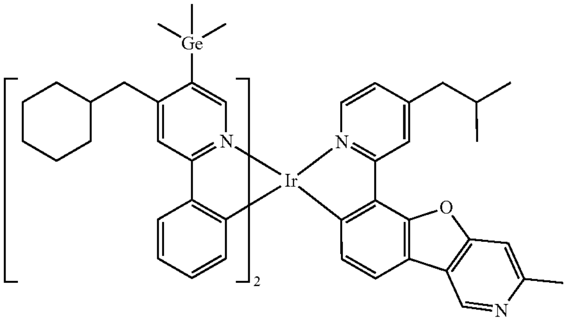
856
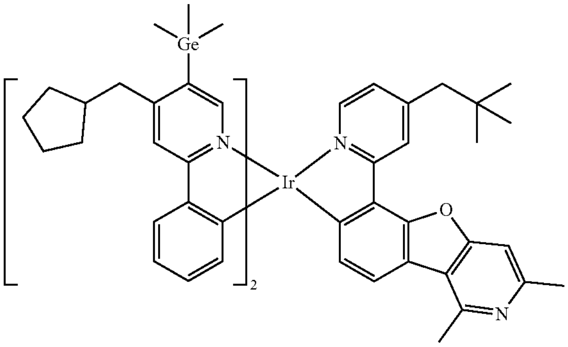
857
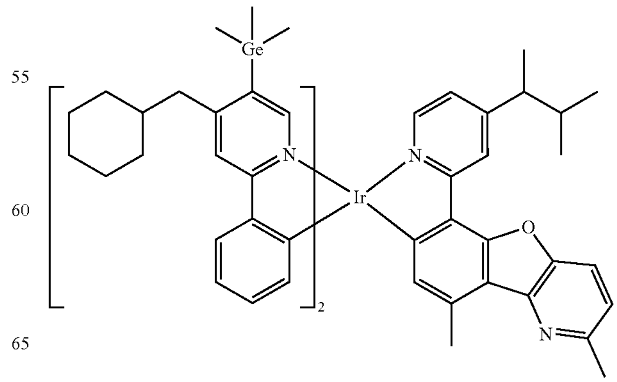

-continued
858
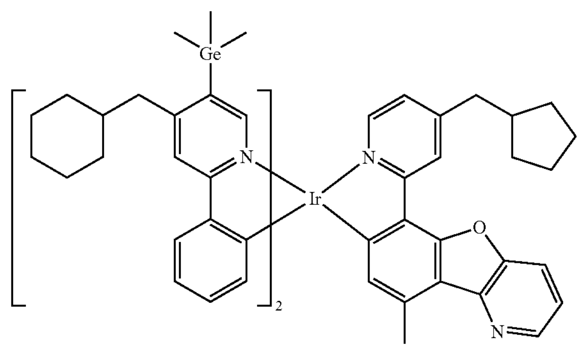
859
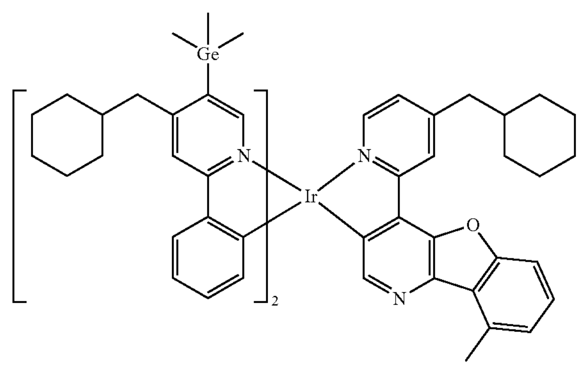
860
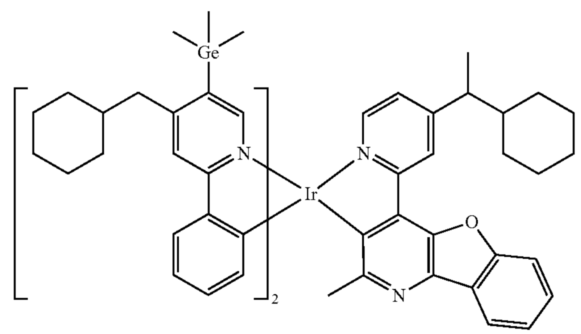
861
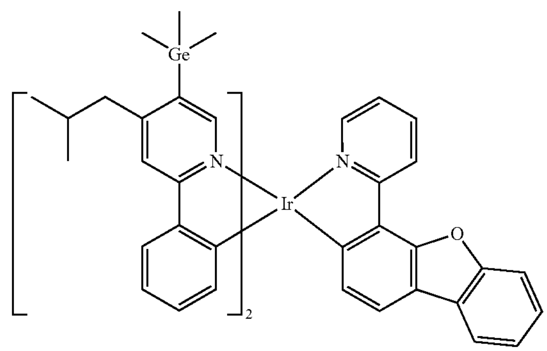
-continued
862
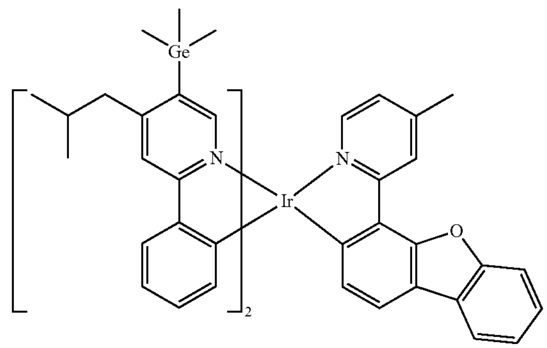
863
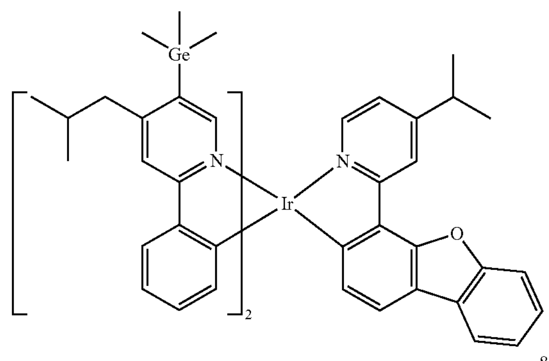
864
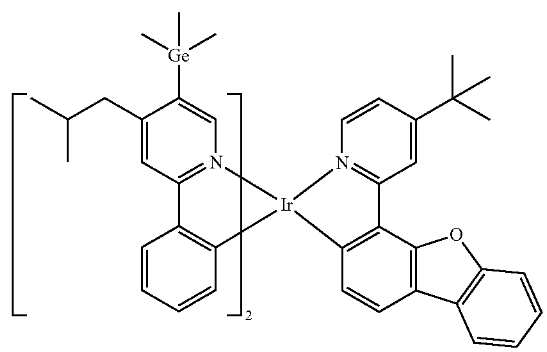
865
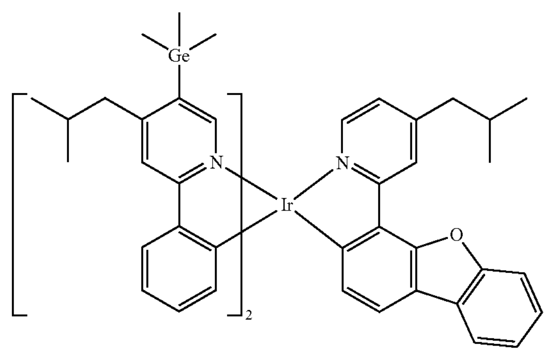

-continued
866
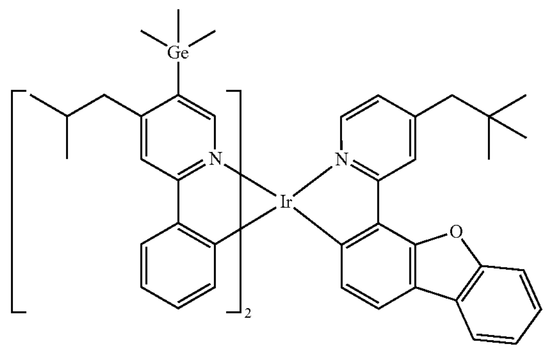
867
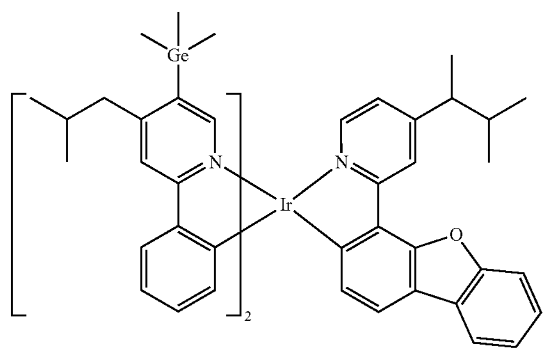
868
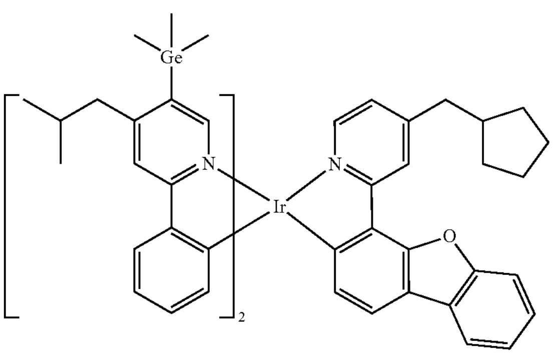
869
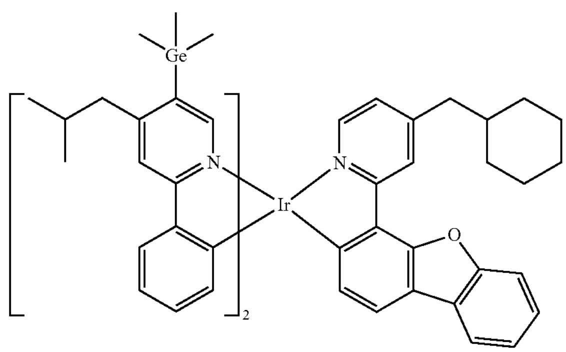
-continued
870
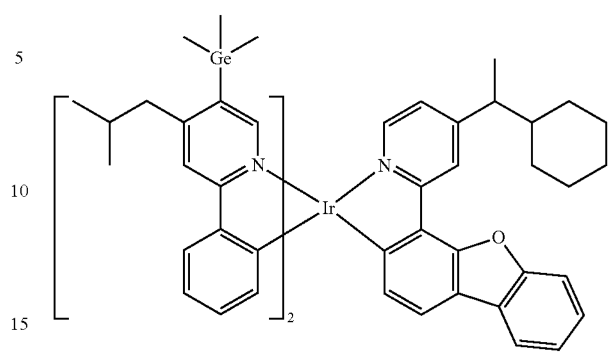
871
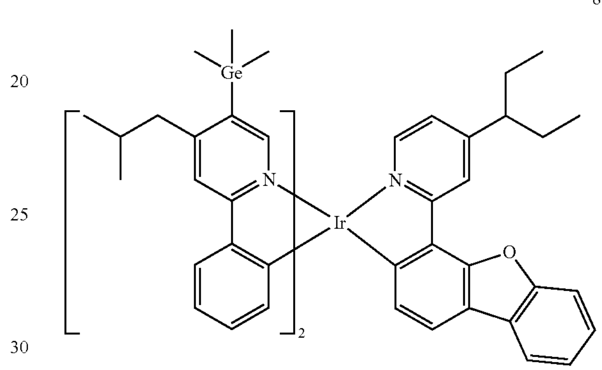
872
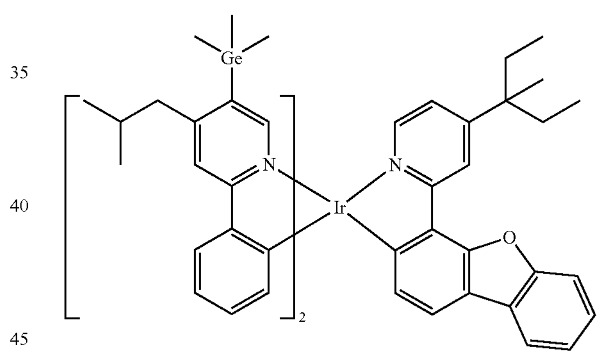
873
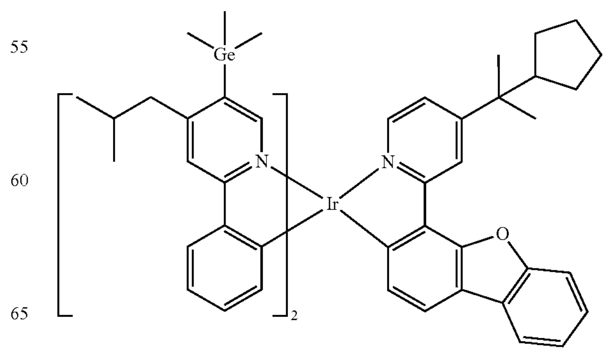

-continued
874
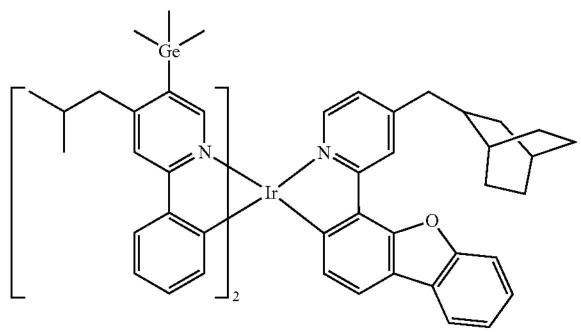
875
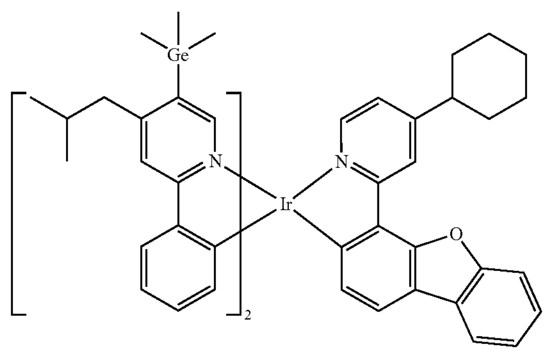
876
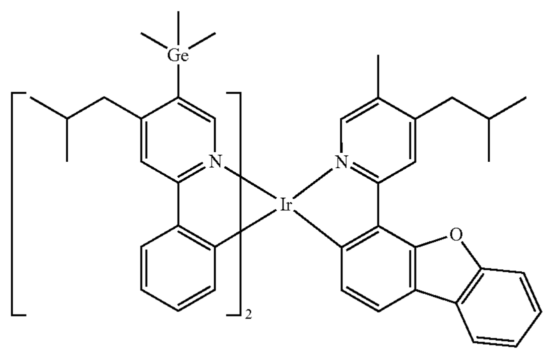
877
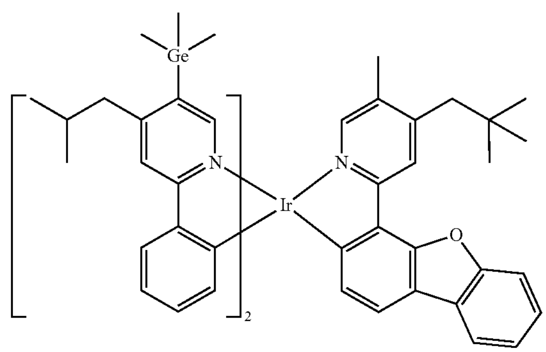
-continued
878
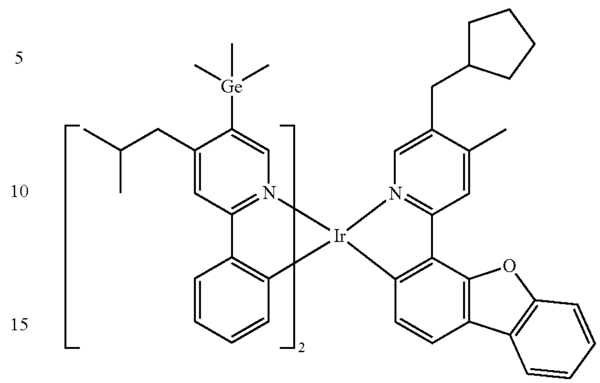
879
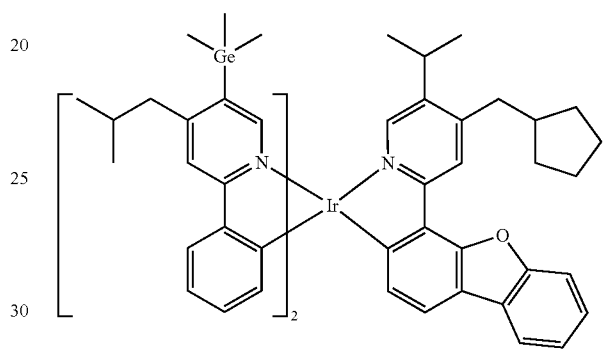
880
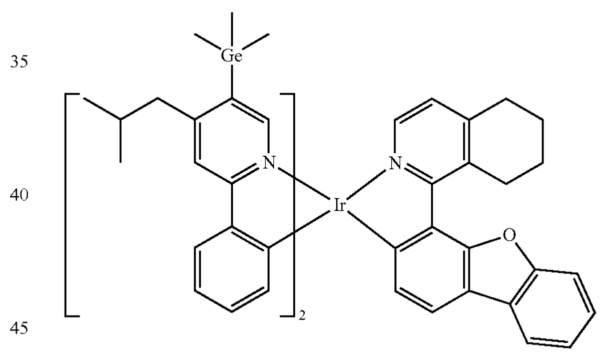
881
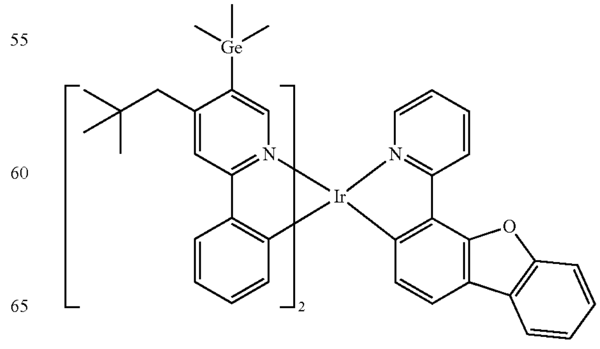

-continued
882
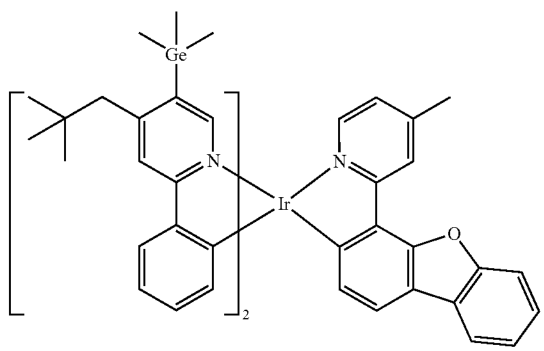
883
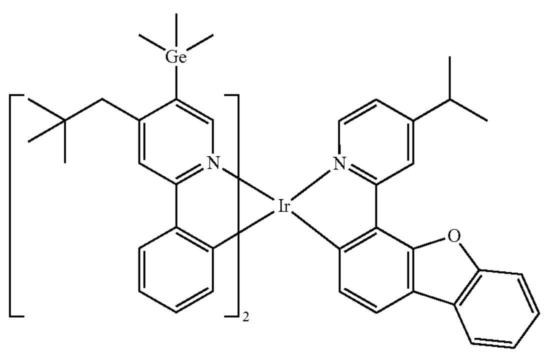
884
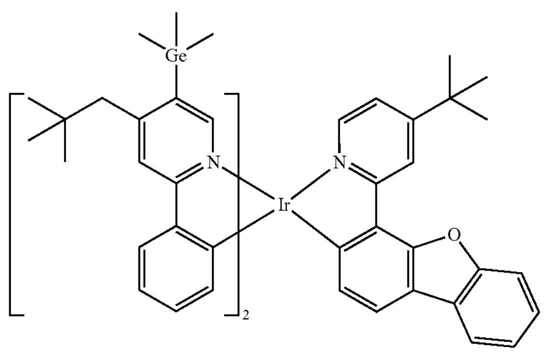
885
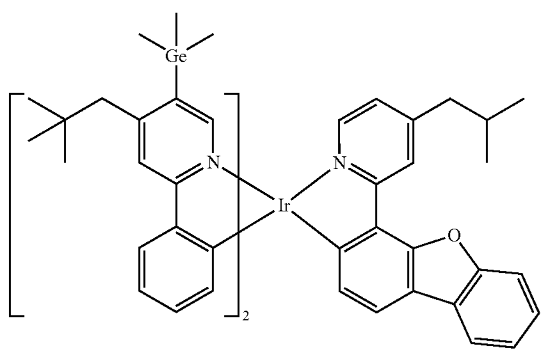
-continued
886
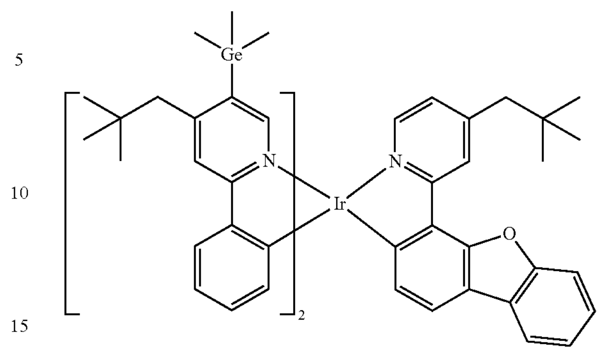
887
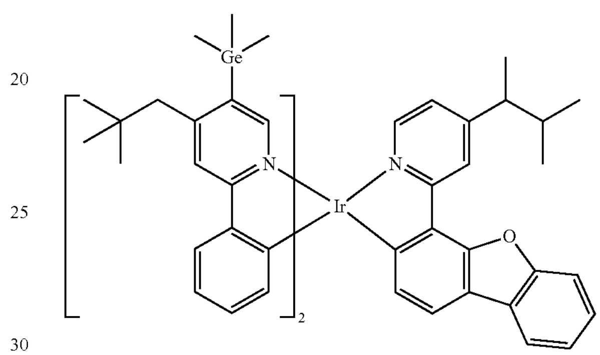
888
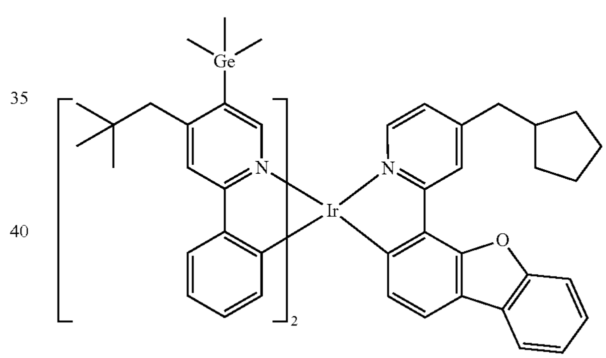
889
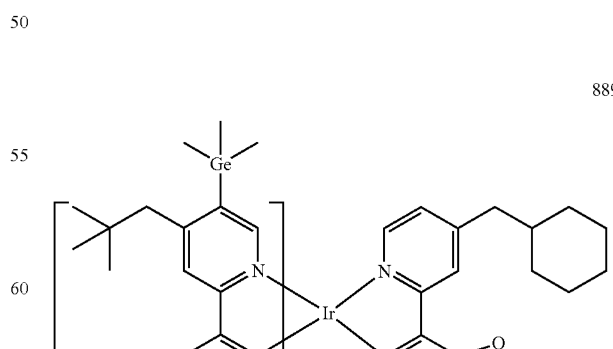
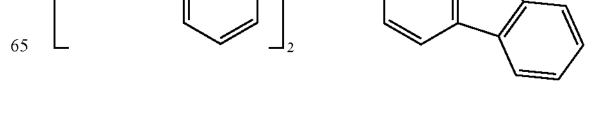

890
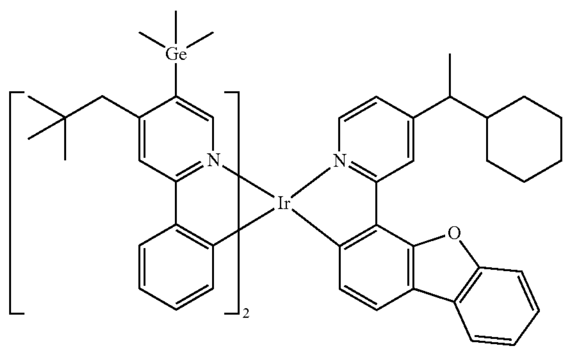
891
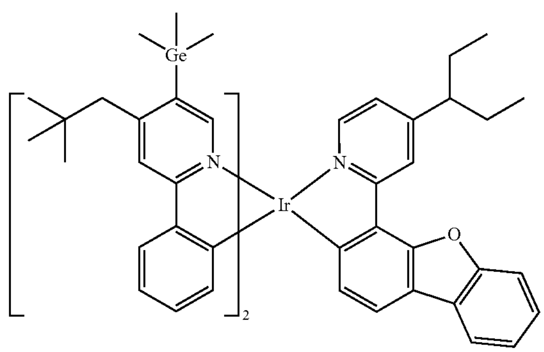
892
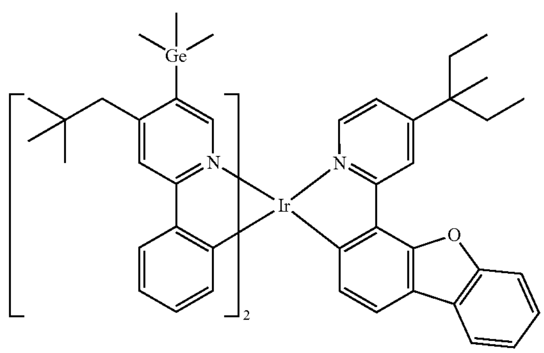
893
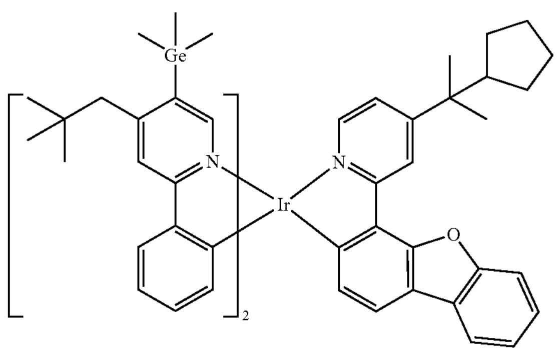
894
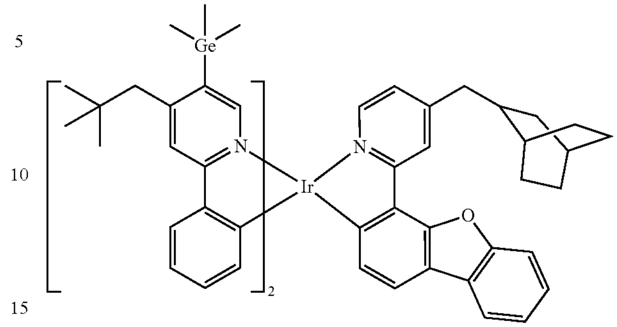
895
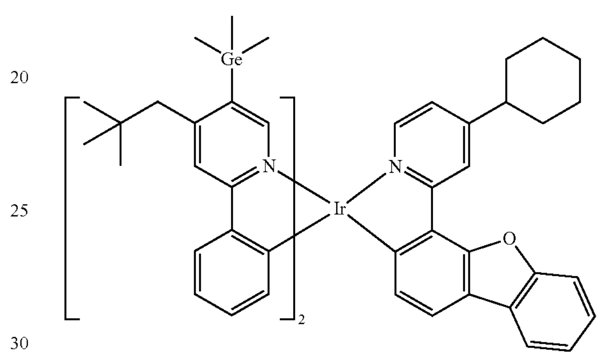
896
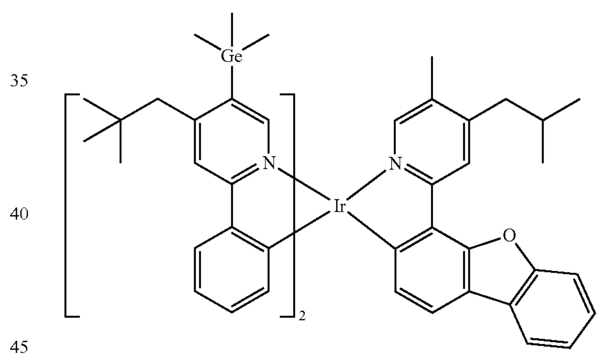
897
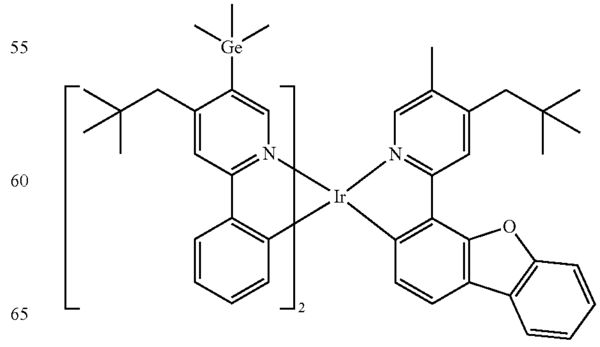

-continued
898
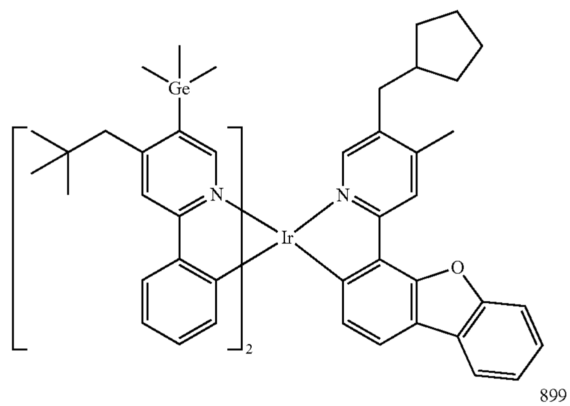
899
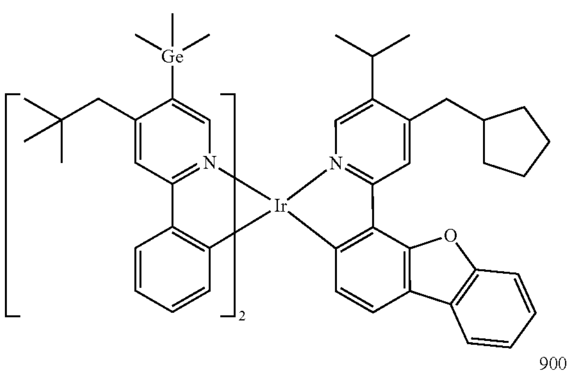
900
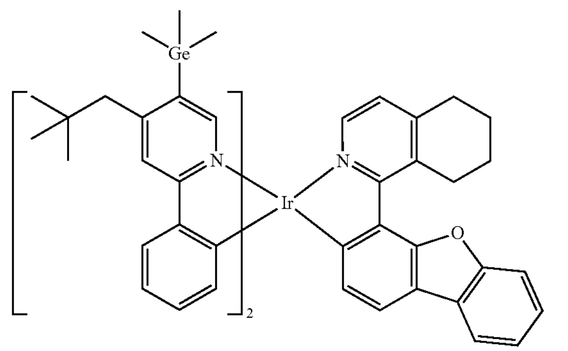
901
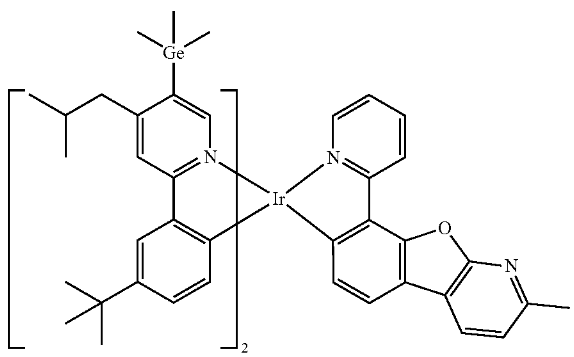
-continued
902
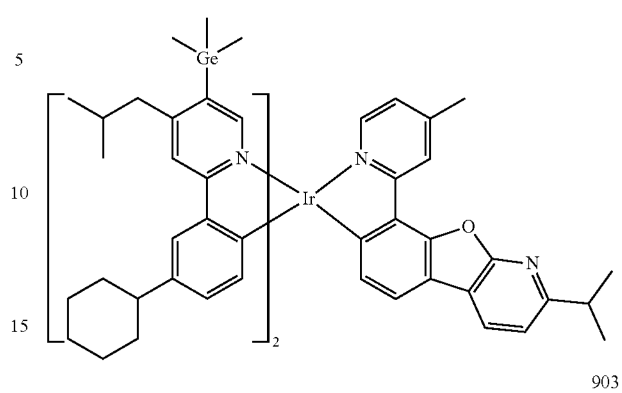
903
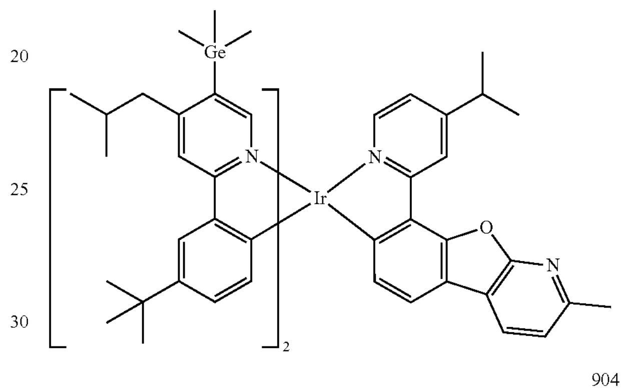
904
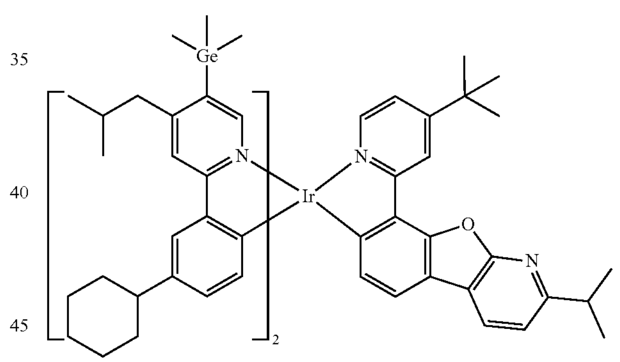
905
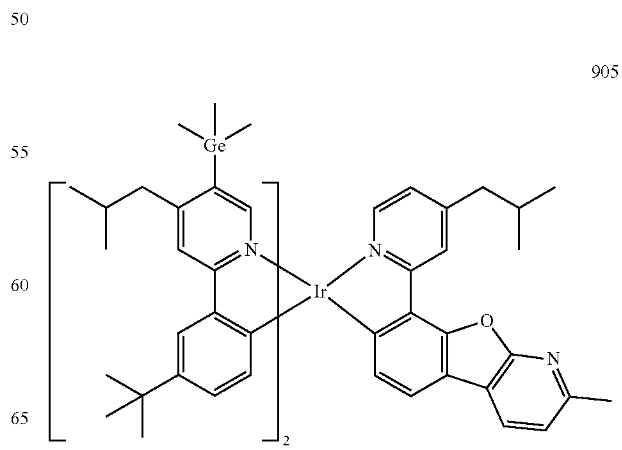

-continued
906
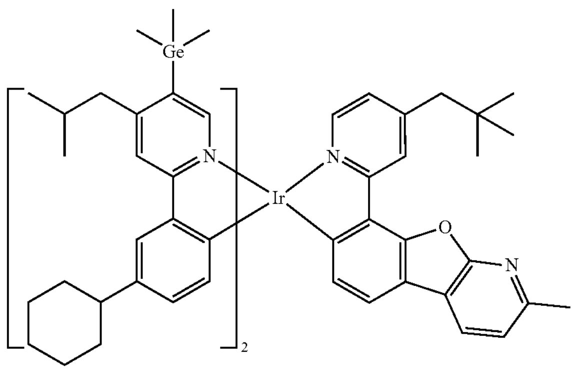
907
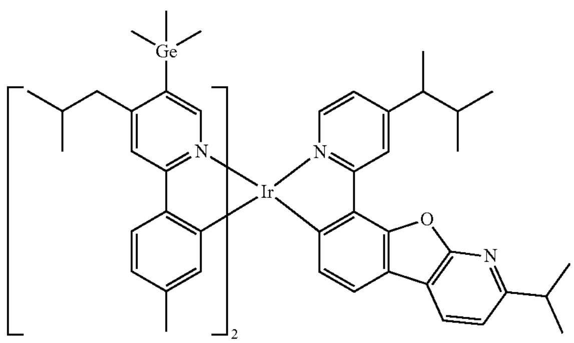
908
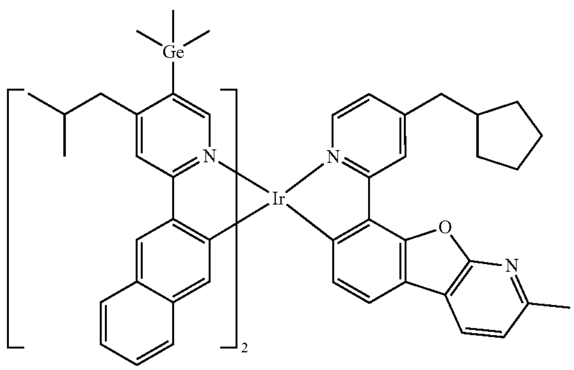
909
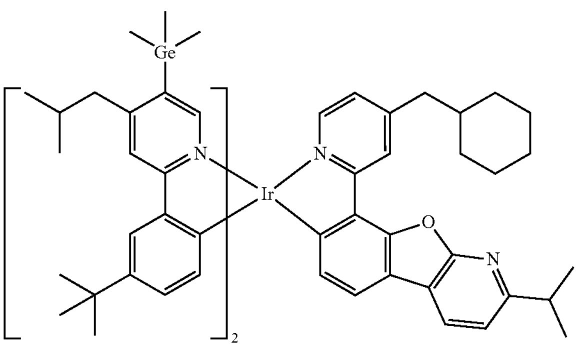
-continued
910
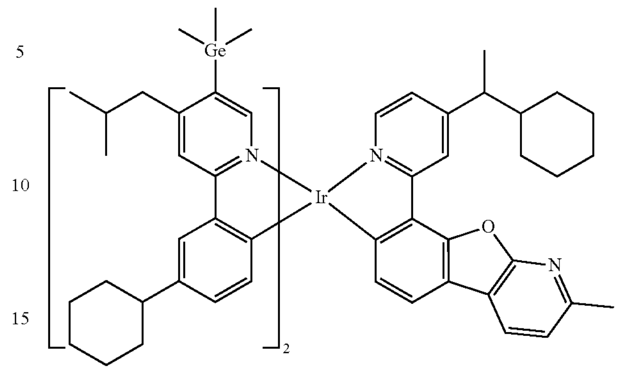
911
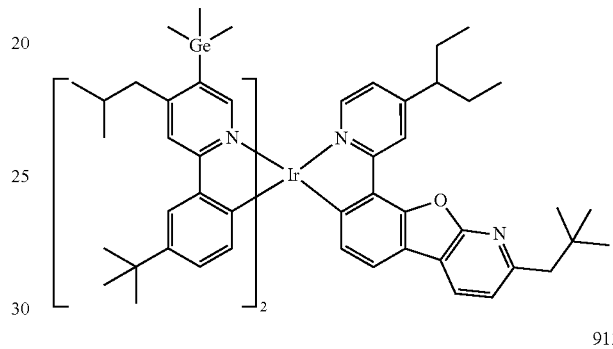
912
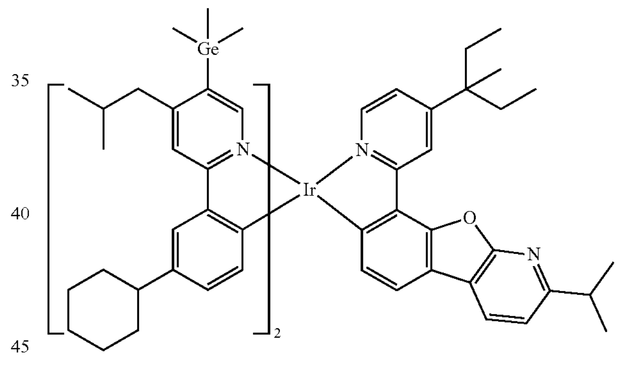
913
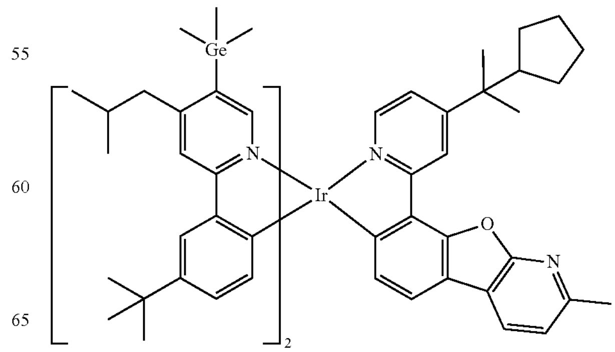

-continued
914
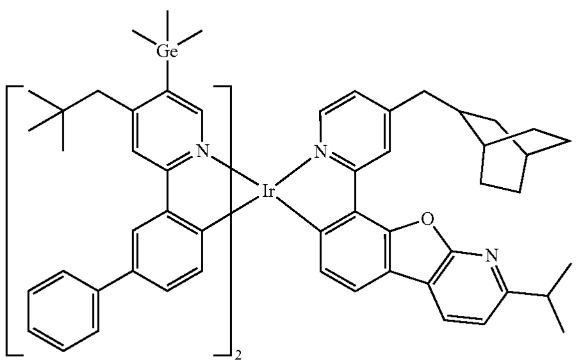
915
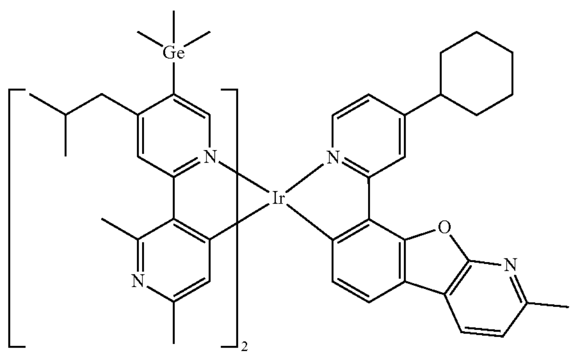
916
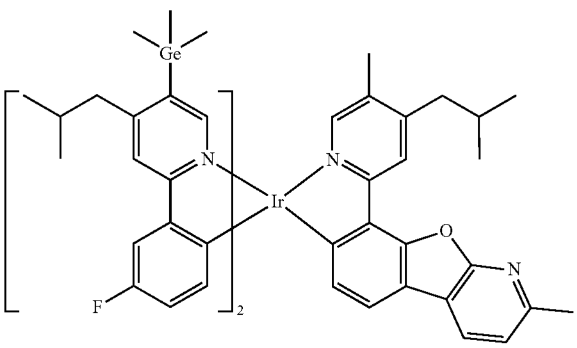
917
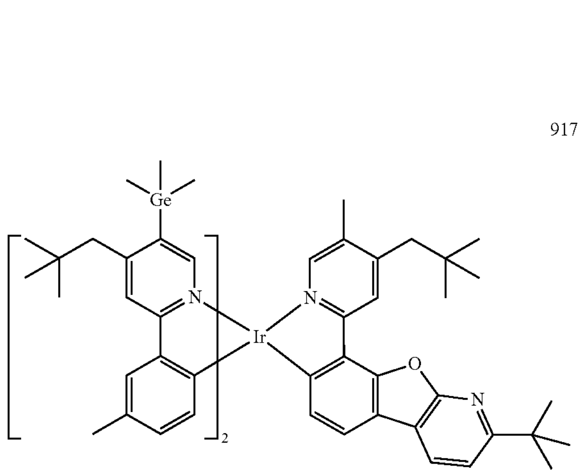
-continued
918
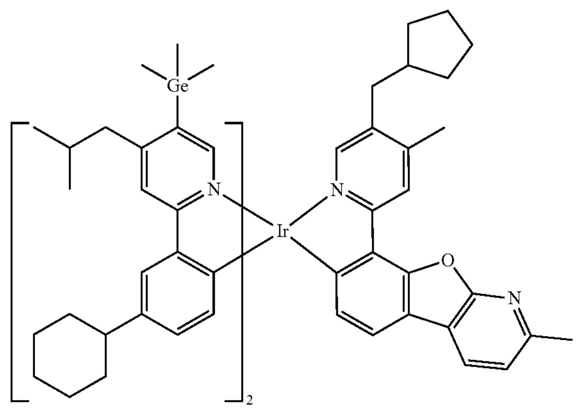
919
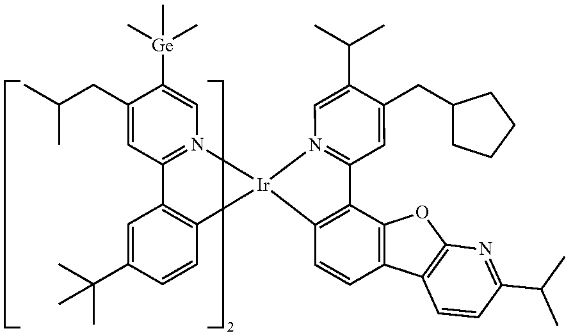
920
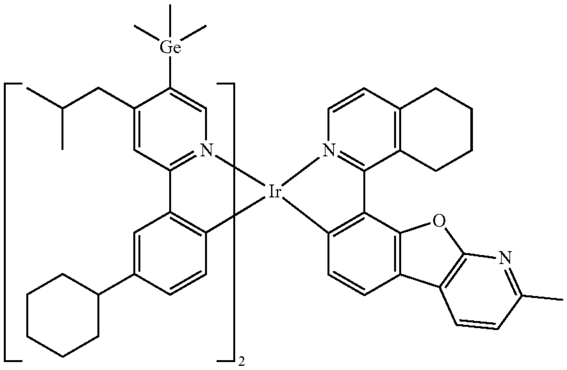
921
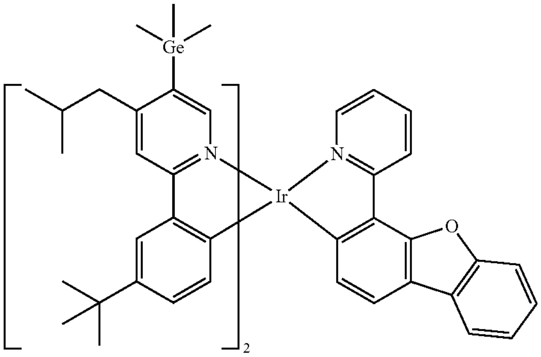

-continued
922
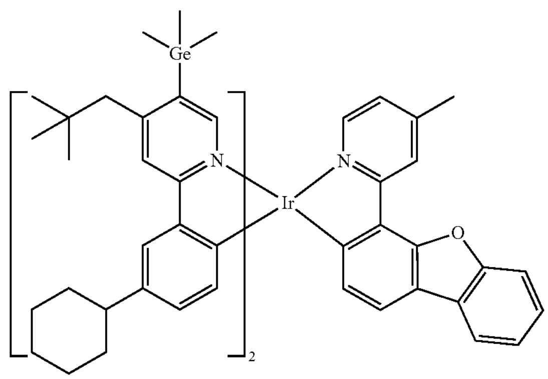
923
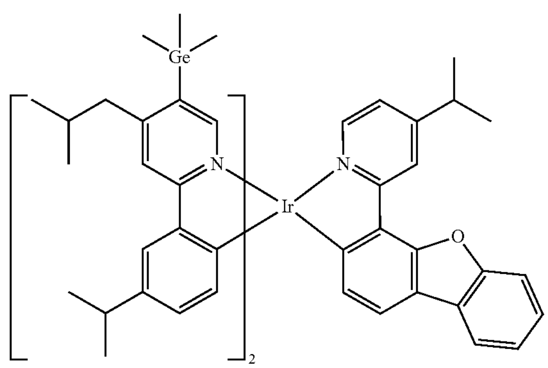
924
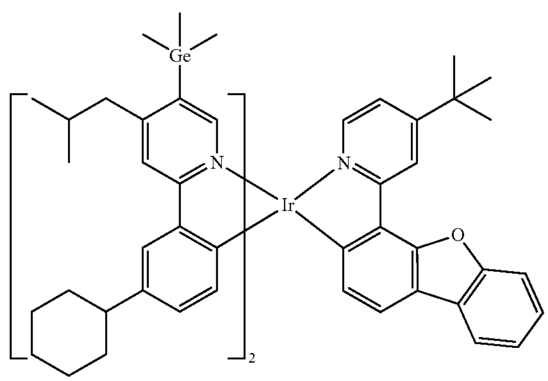
925
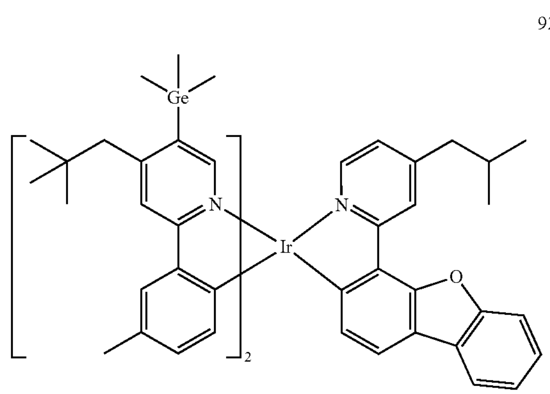
-continued
926
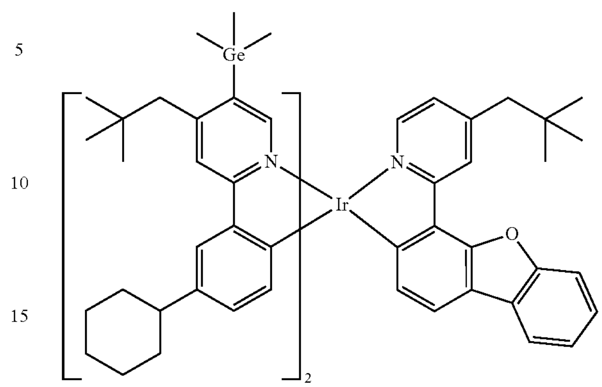
927
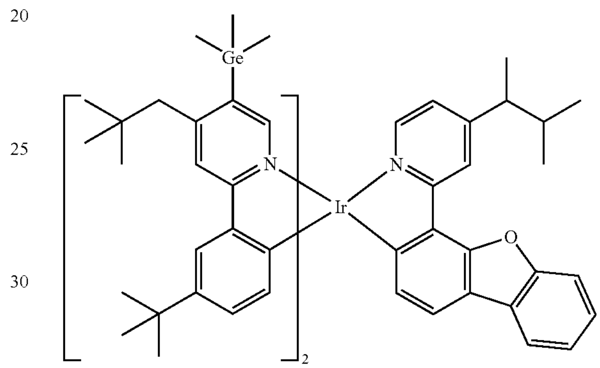
928
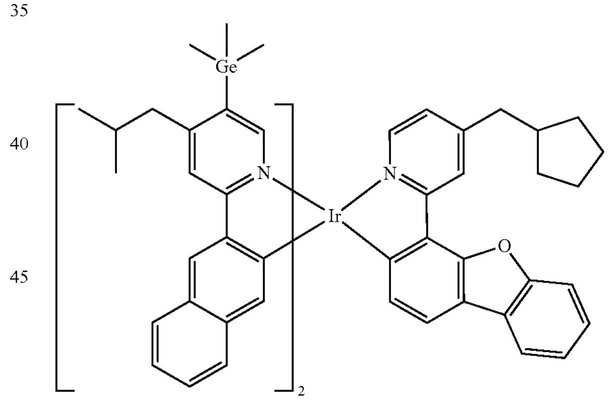
929
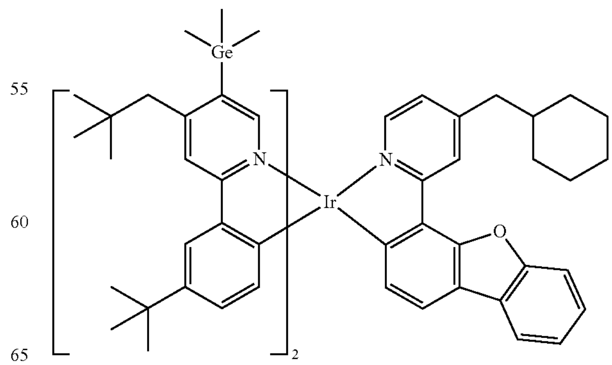

-continued
930
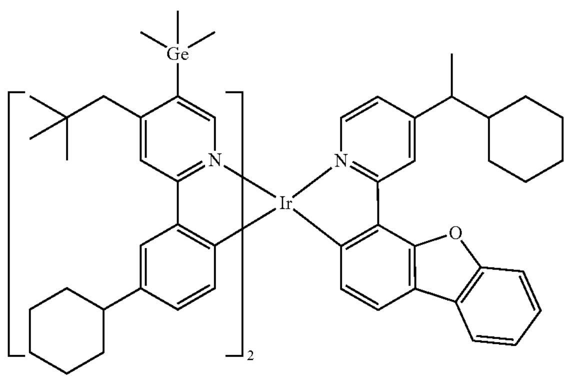
931
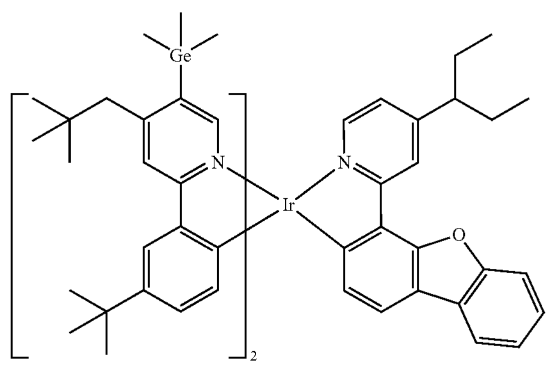
932
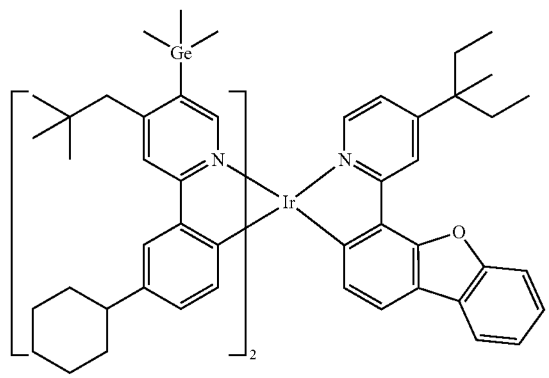
933
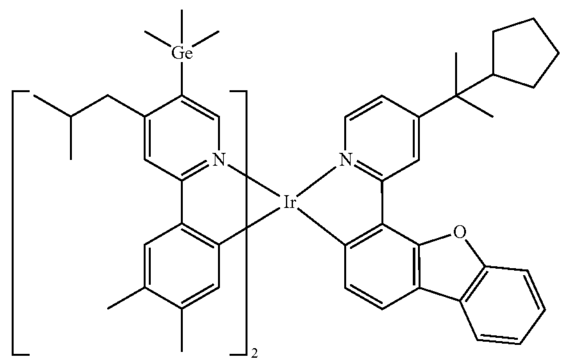
-continued
934
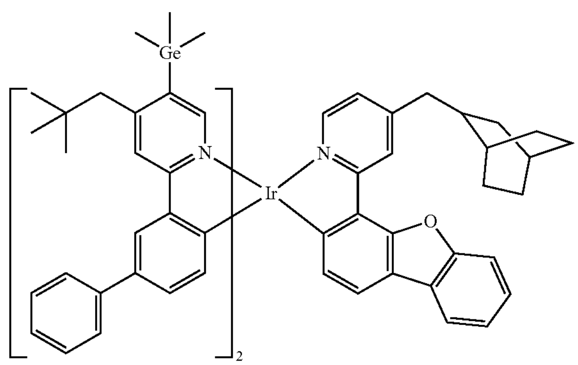
935
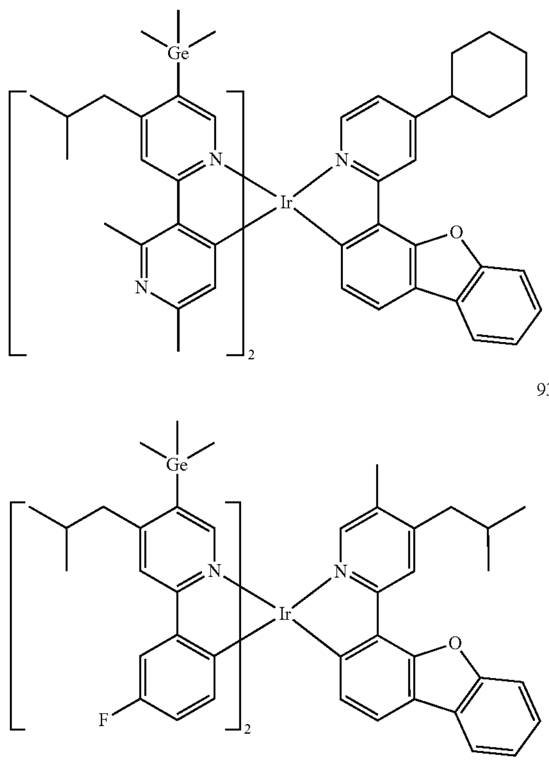
936
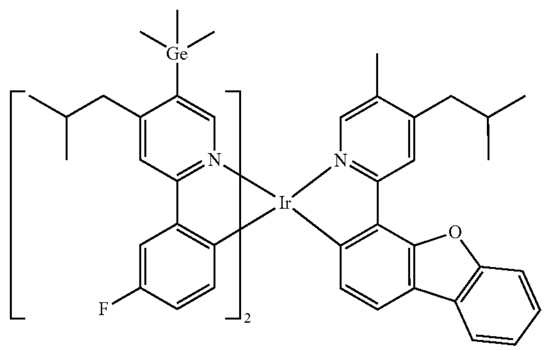
937
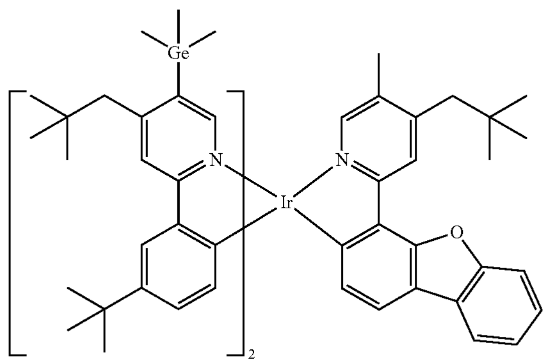

-continued
938
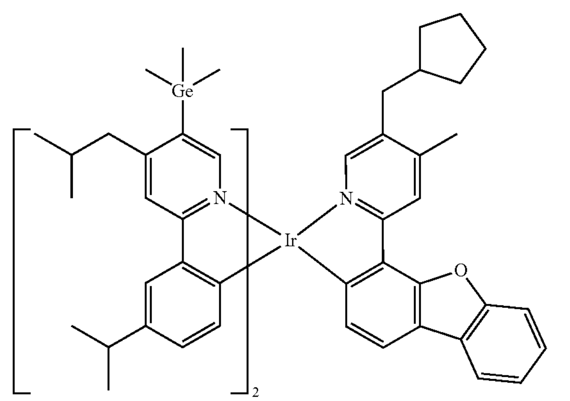
939
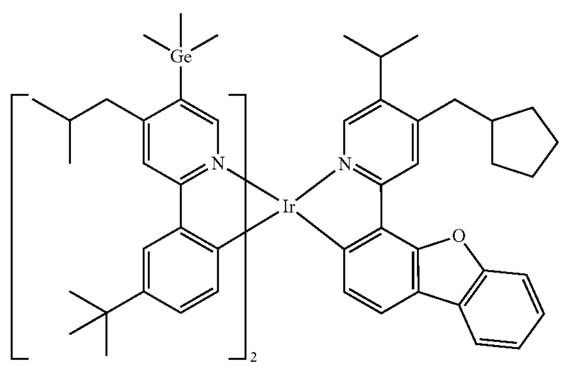
940
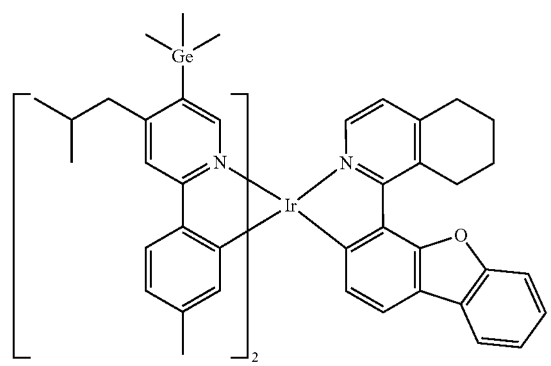
941
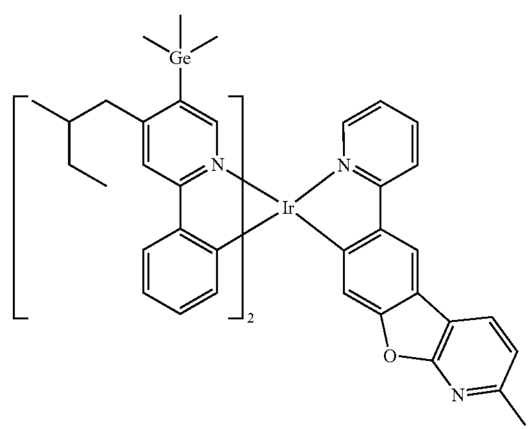
-continued
942
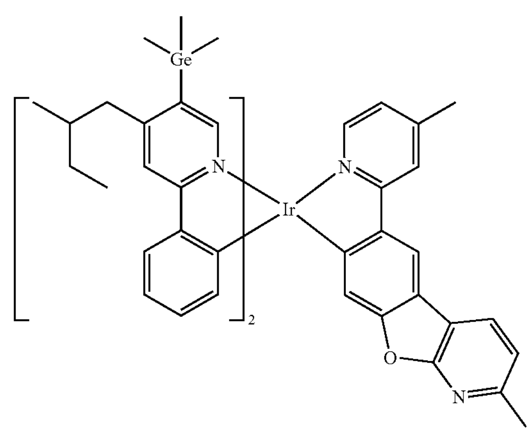
943
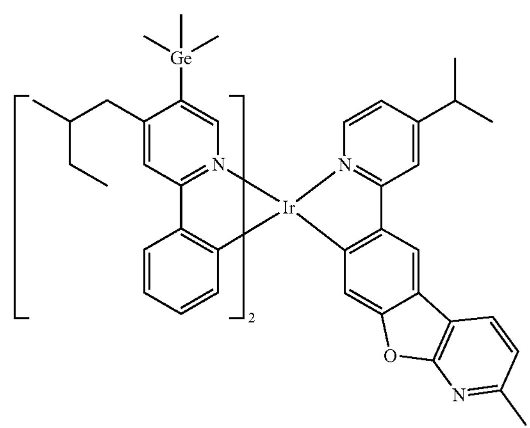
944
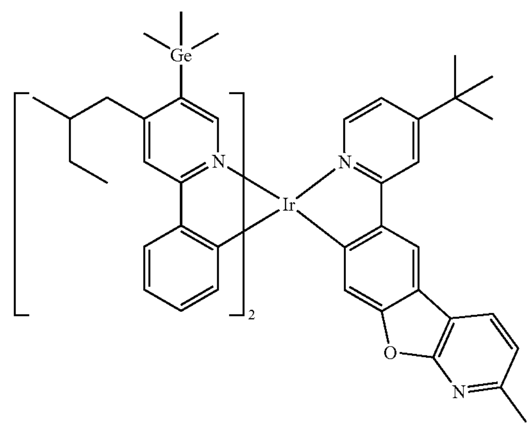

945
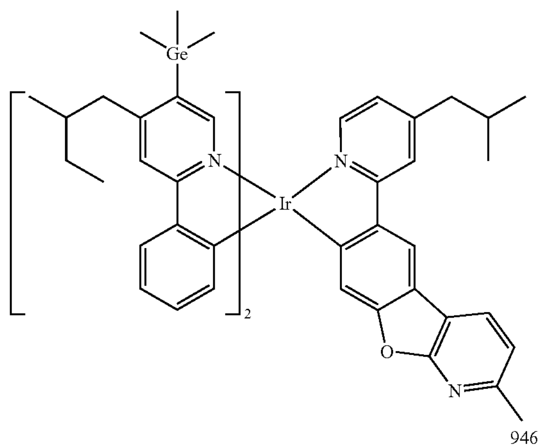
946
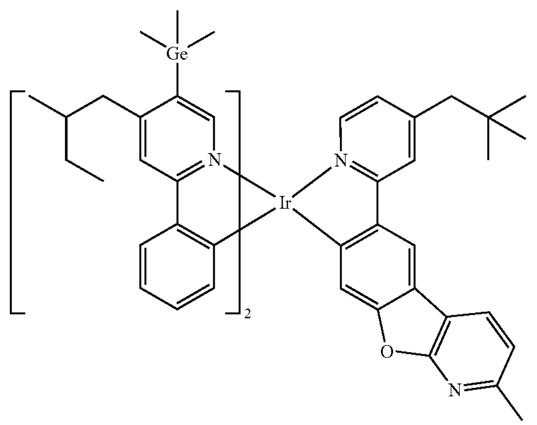
947
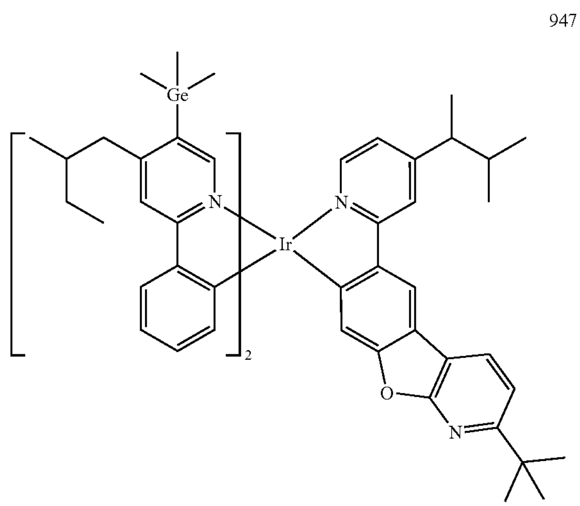
948
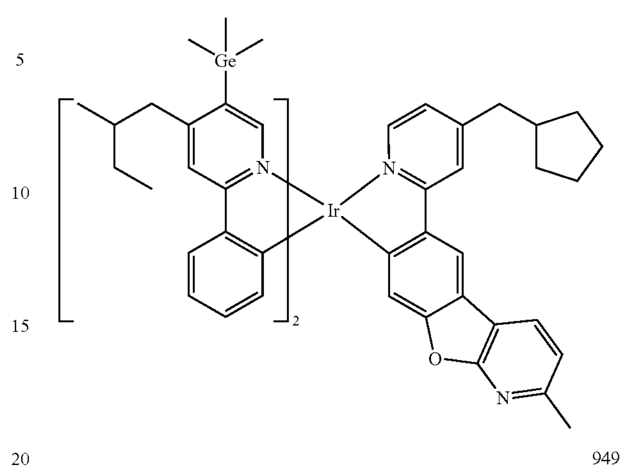
949
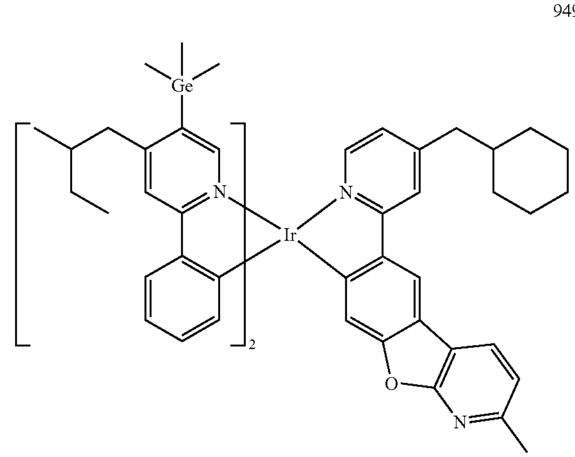
950
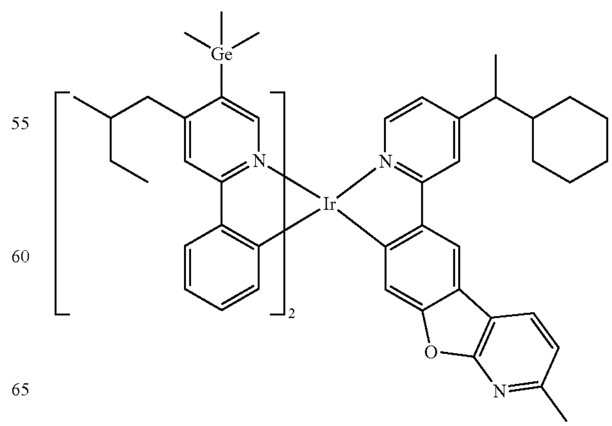

951
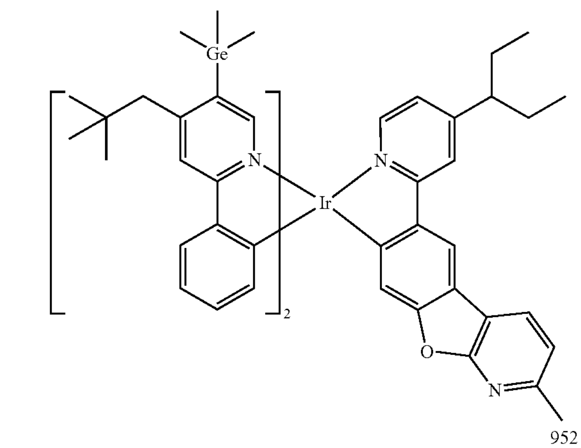
952
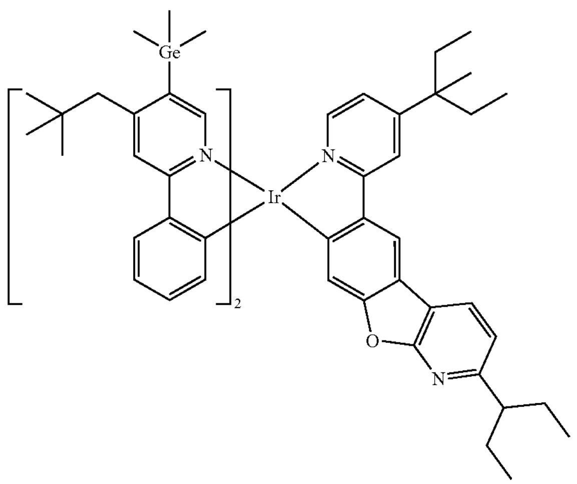
953
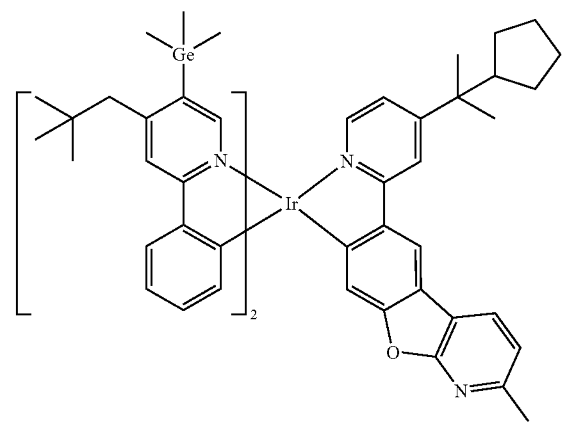
954
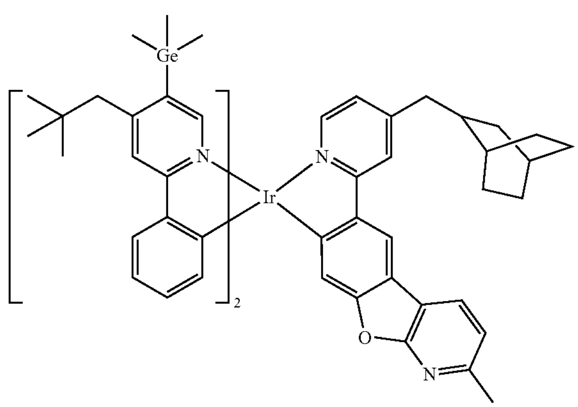
955
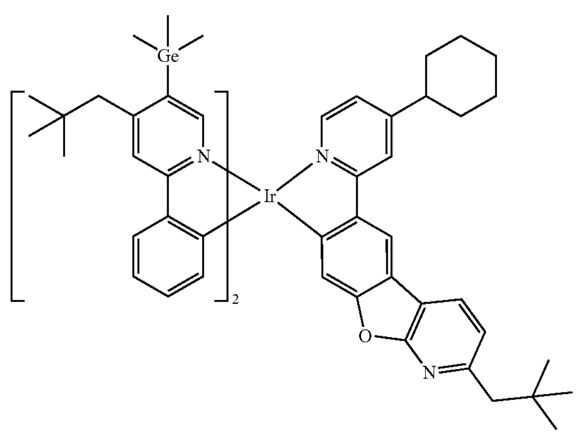
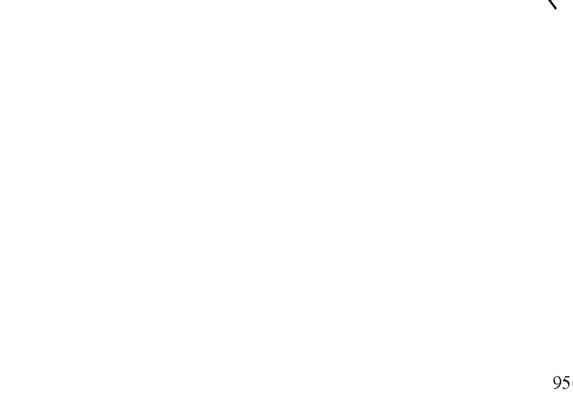
956
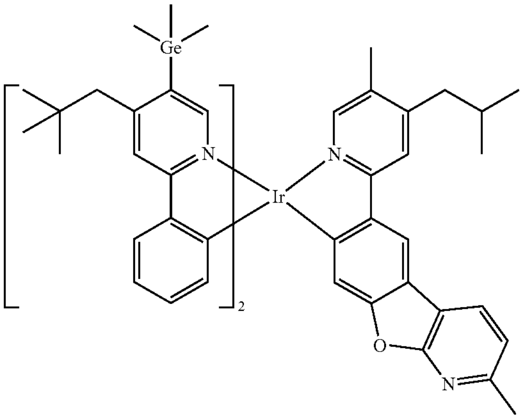

957
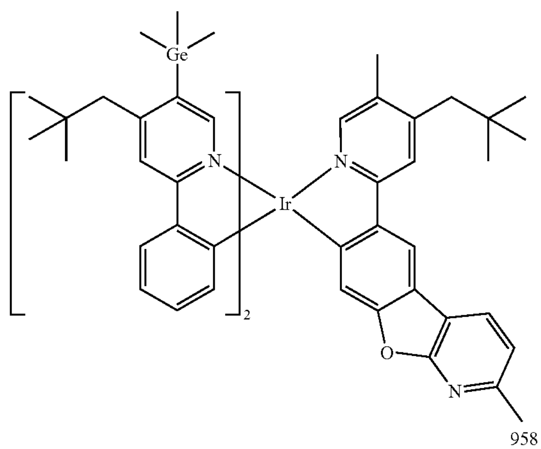
958
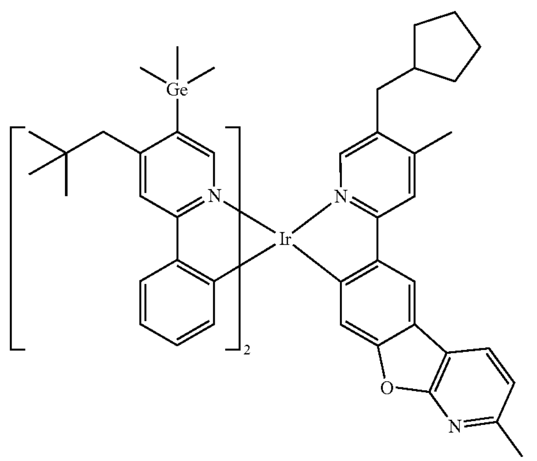
959
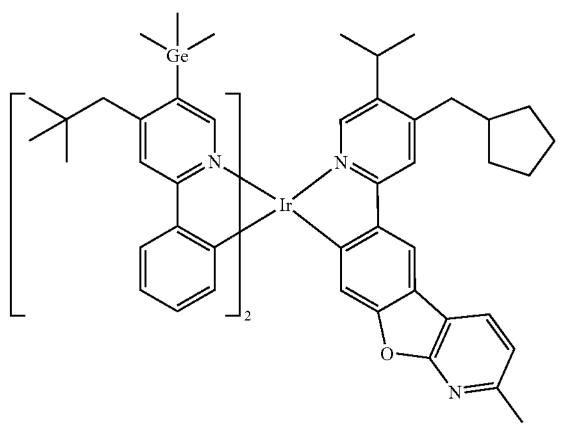
960
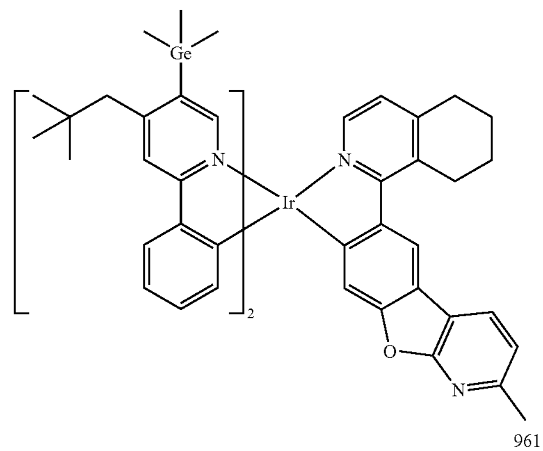
961
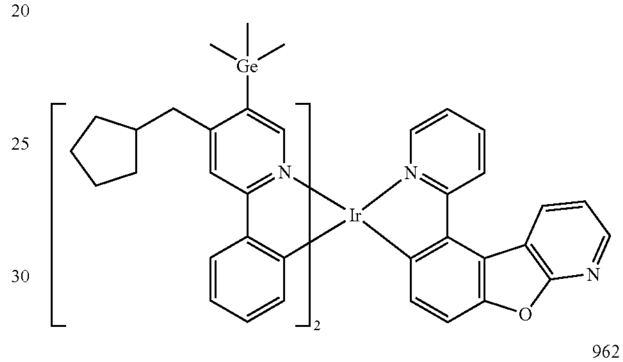
962
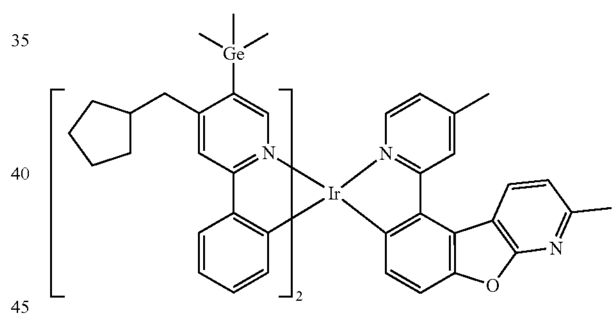
963
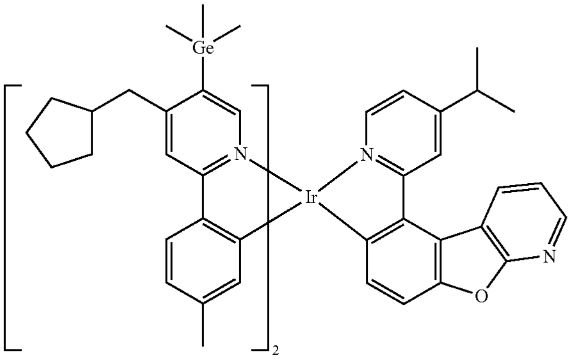

-continued
964
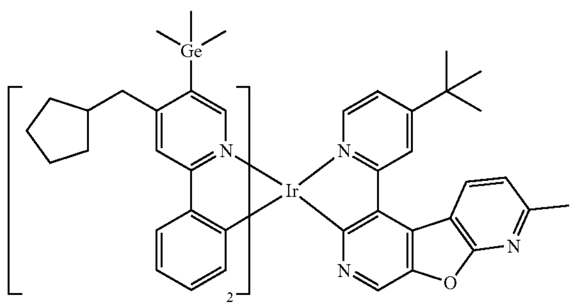
965
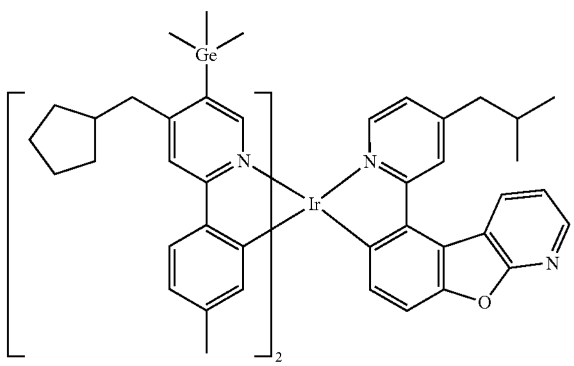
966
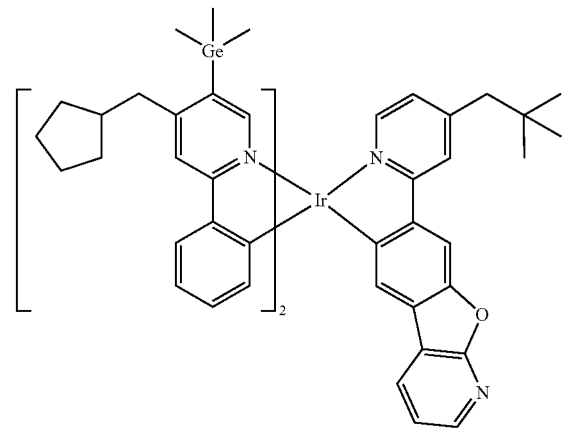
967
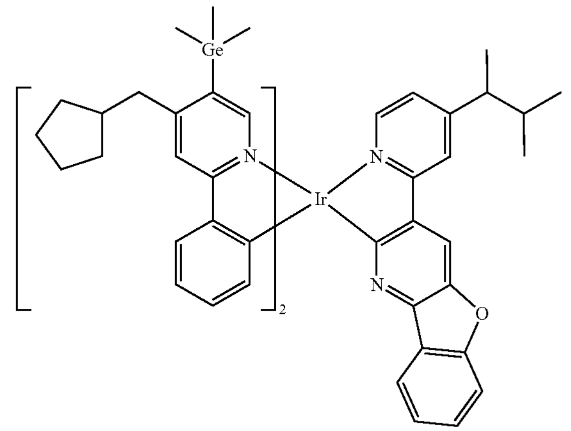
-continued
968
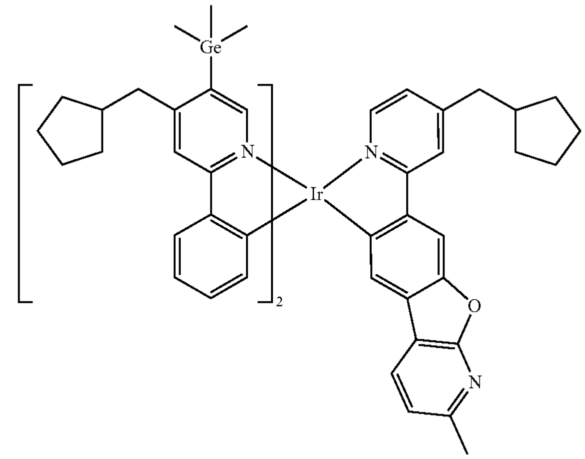
969
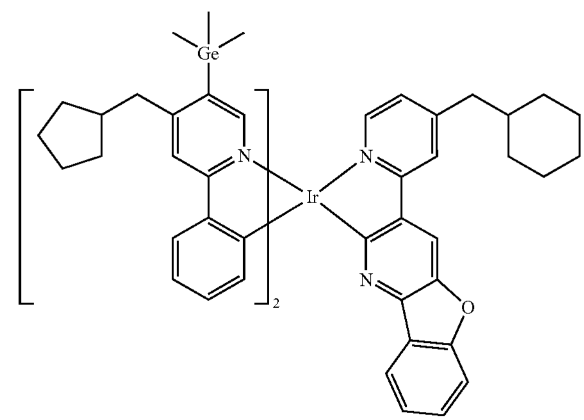
970
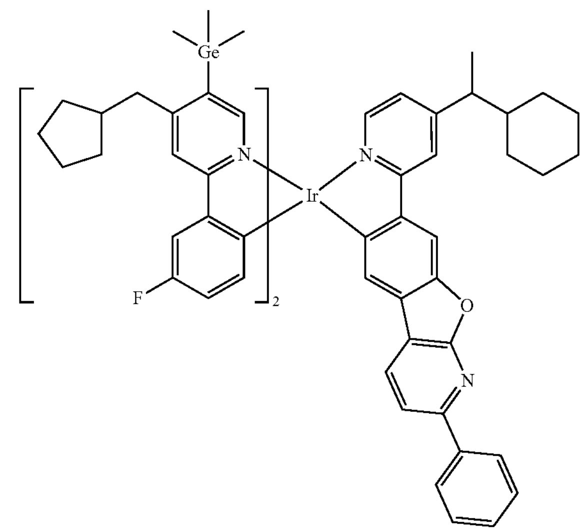

-continued
971
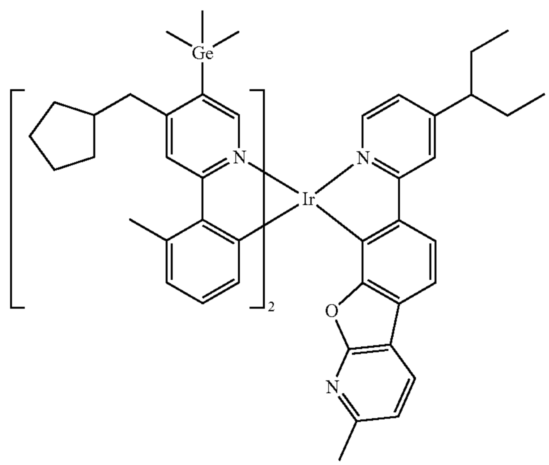
972
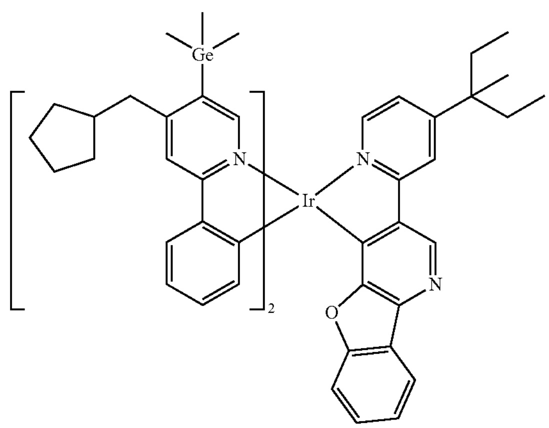
973
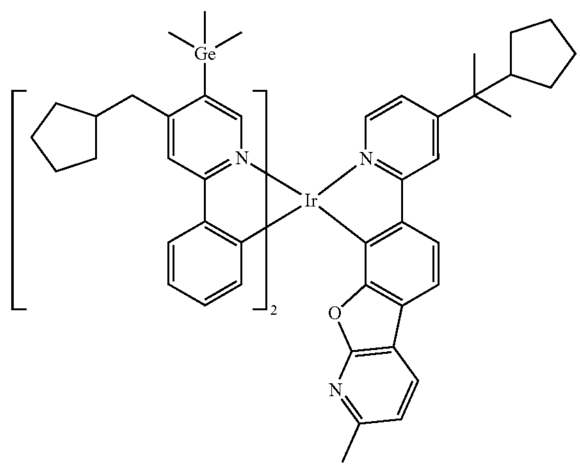
-continued
974
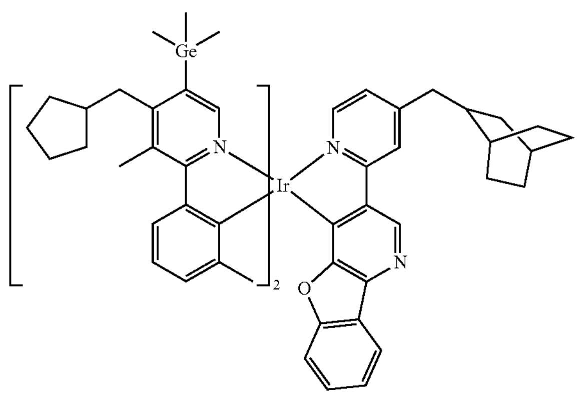
975
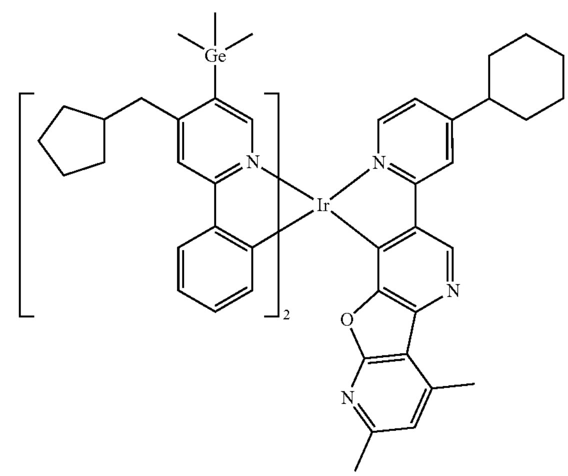
976
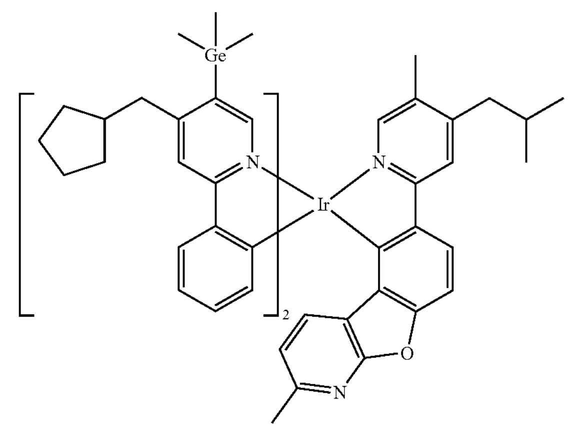

-continued
977
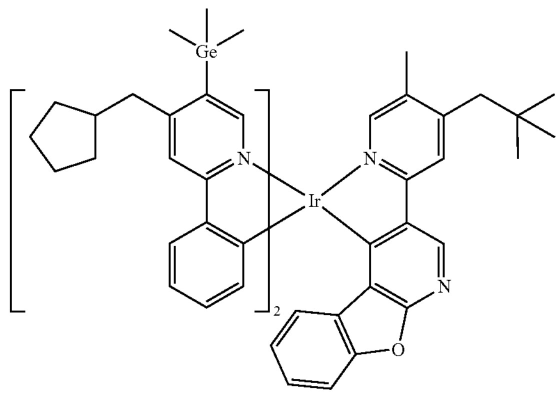
978
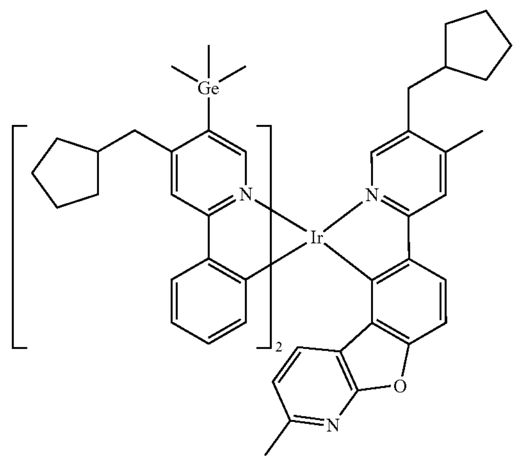
979
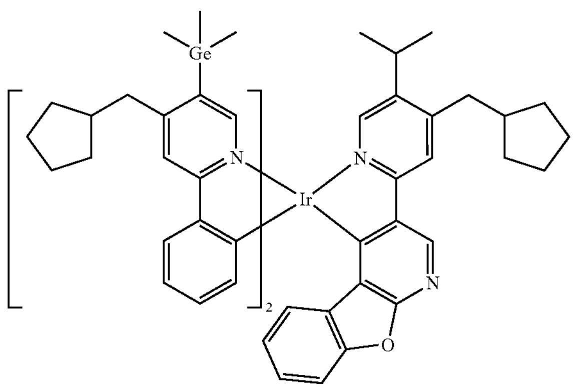
-continued
980
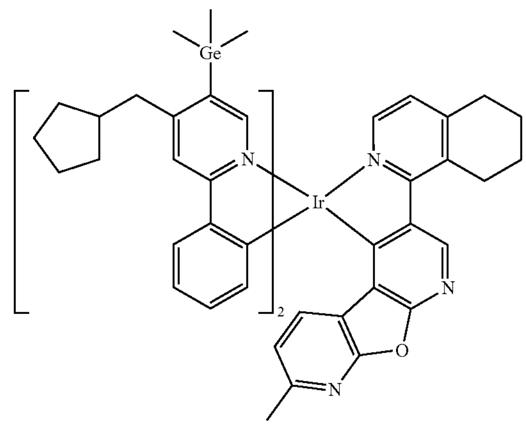
981
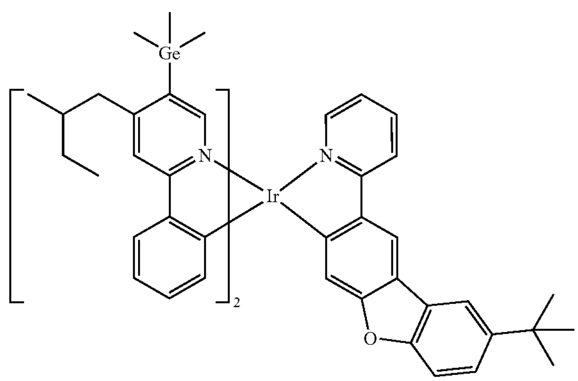
982
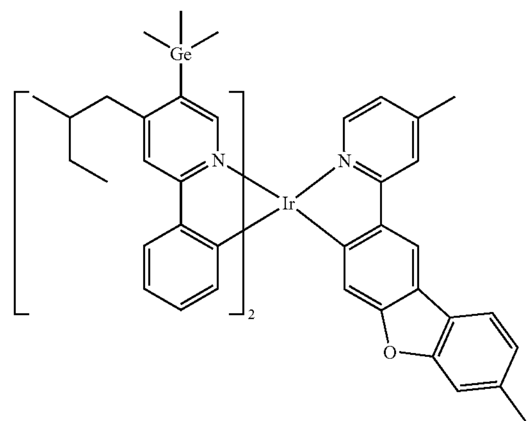

-continued
983
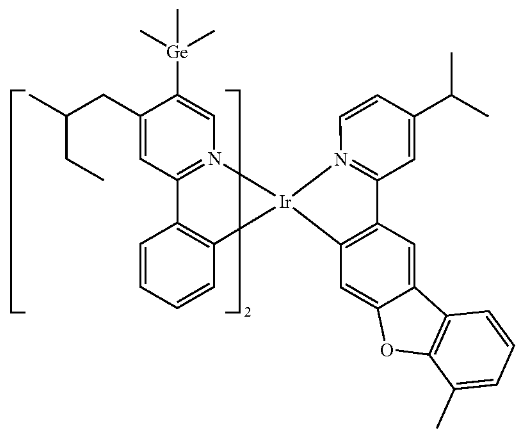
984
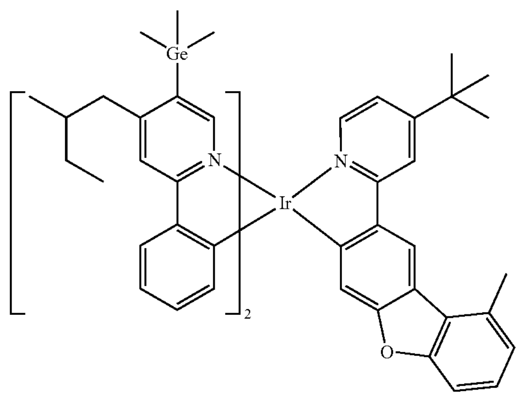
985
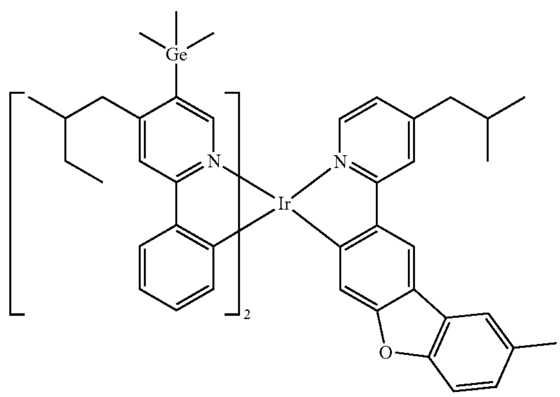
-continued
986
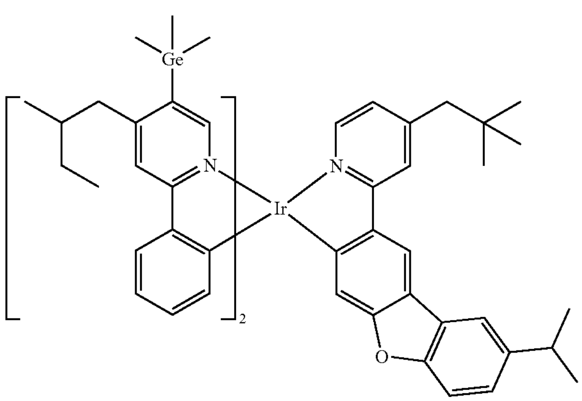
987
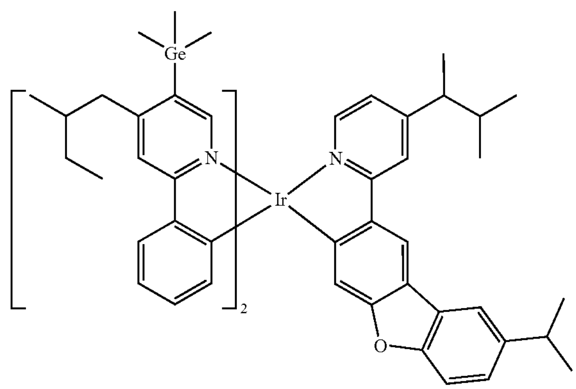
988
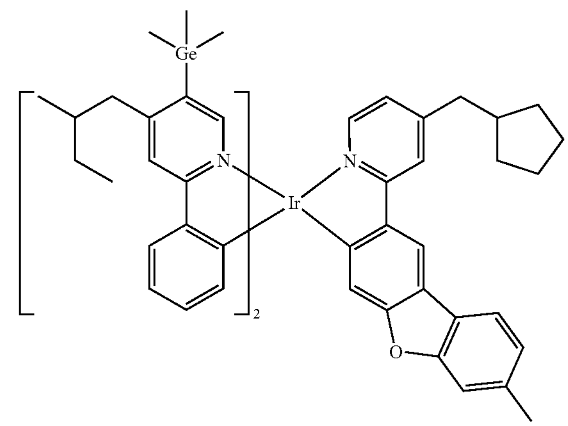

-continued
989
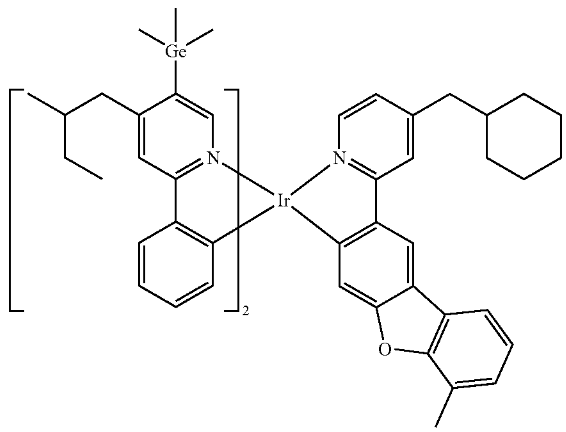
990
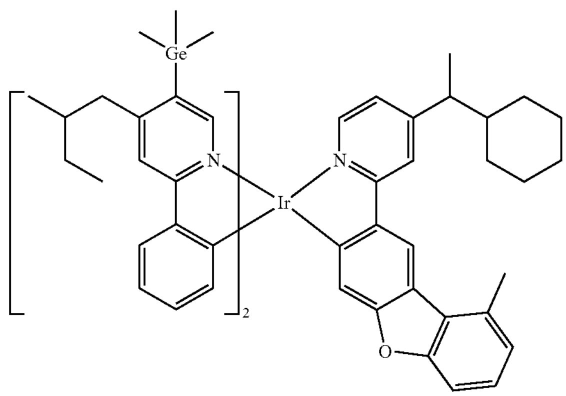
991
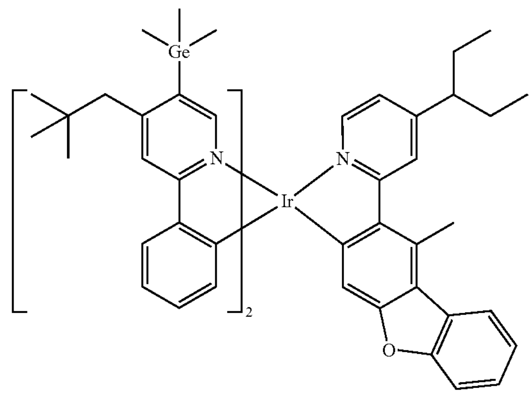
-continued
992
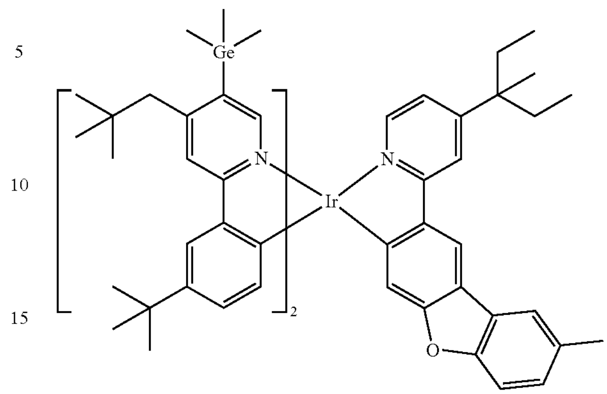
993
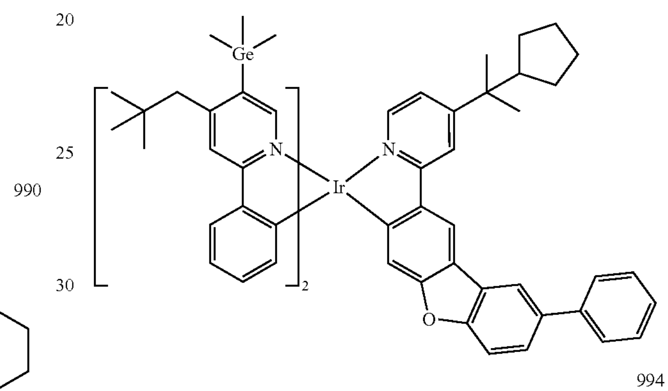
994
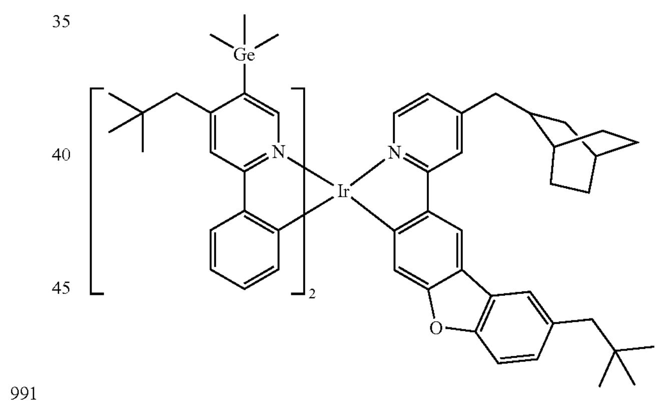
995
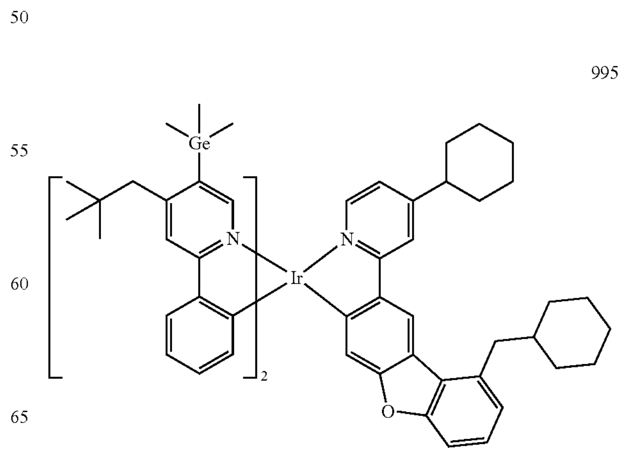

-continued
996
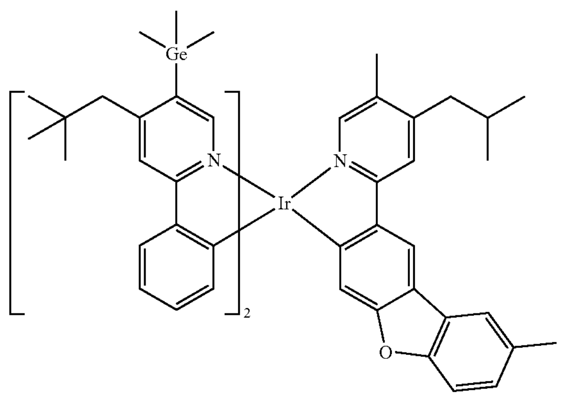
997
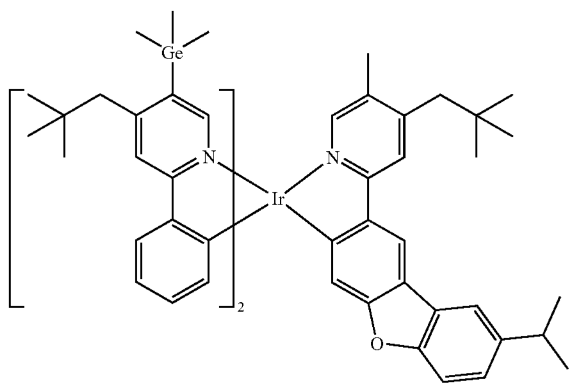
998
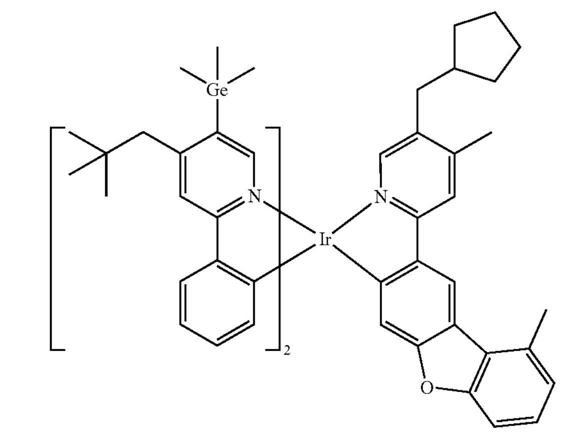
999
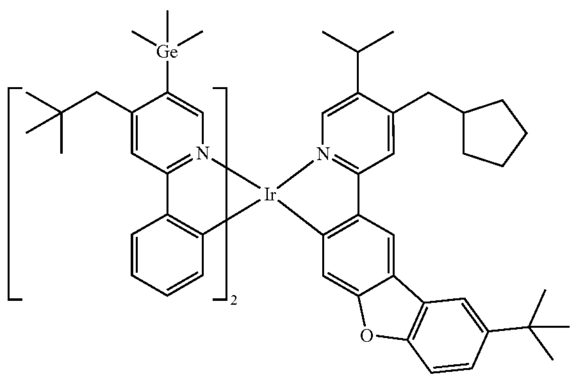
-continued
1000
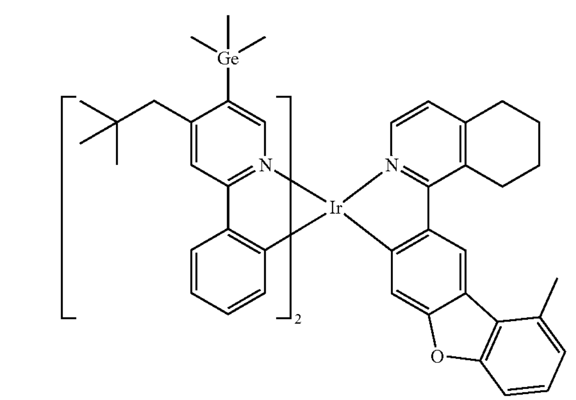
1001
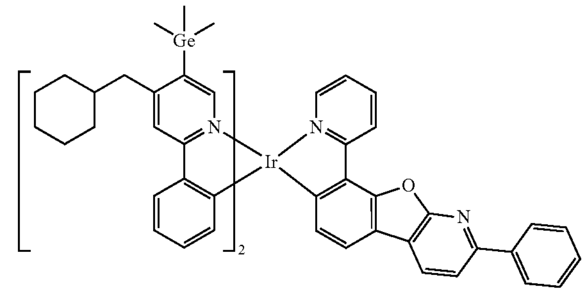
1002
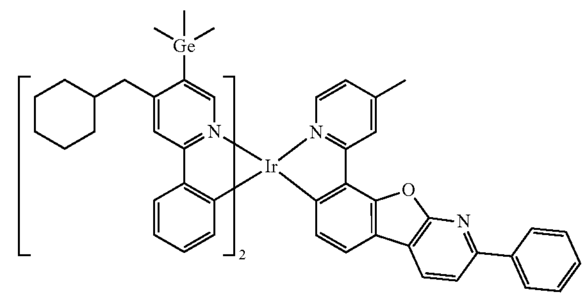
1003
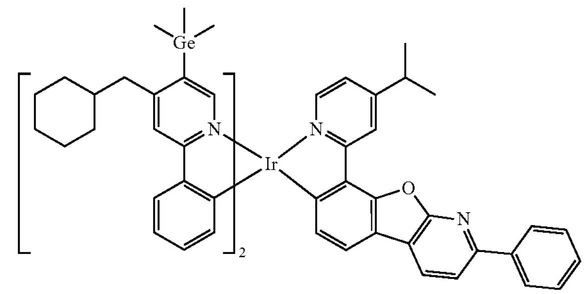

-continued
1004
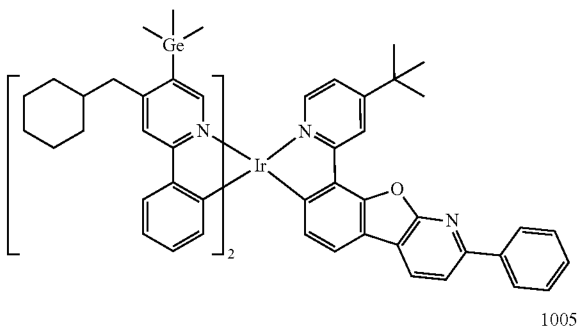
1005
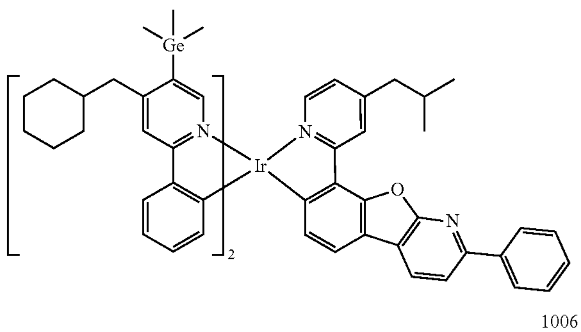
1006
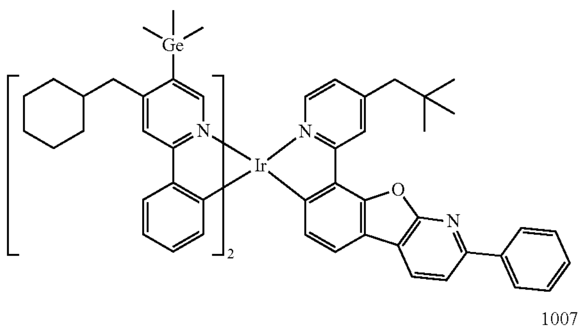
1007
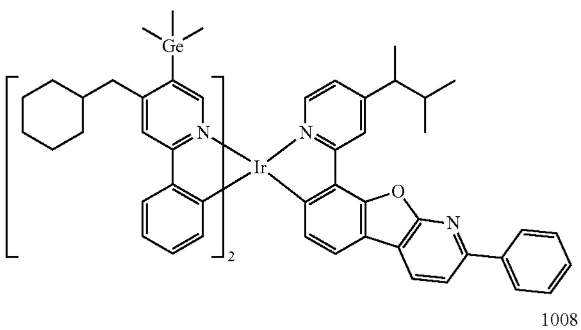
1008
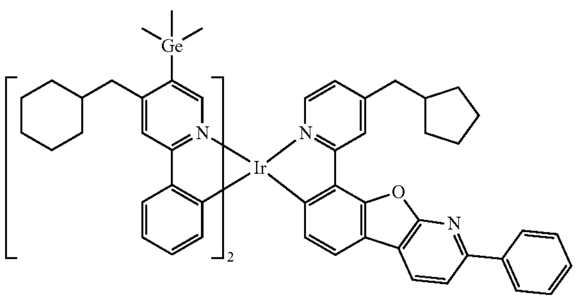
-continued
1009
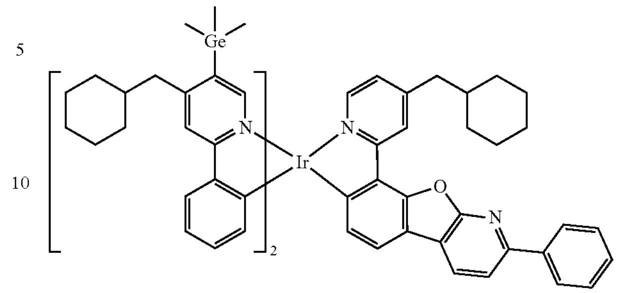
1010
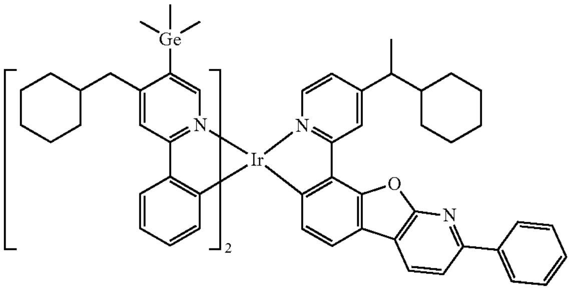
1011
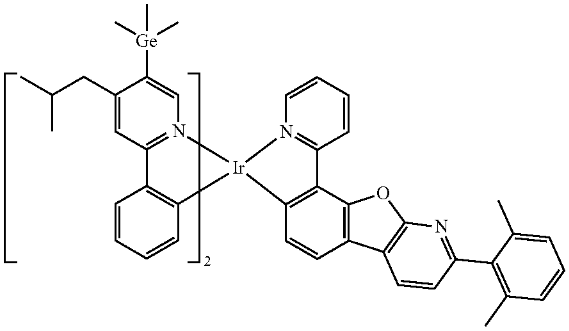
1012
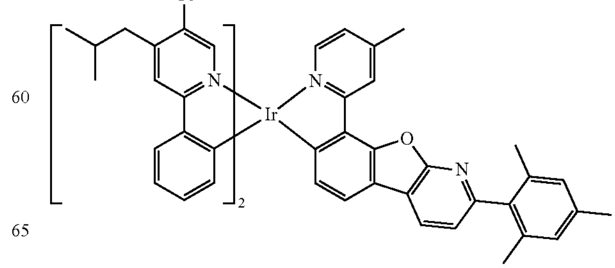

-continued
1013
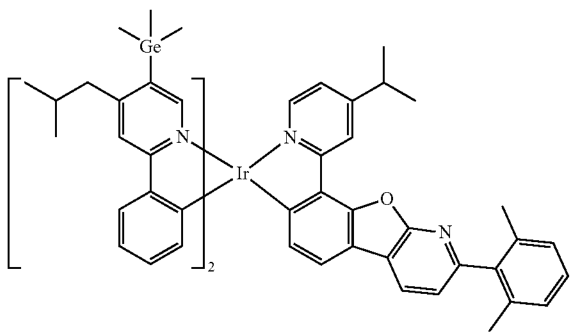
1014
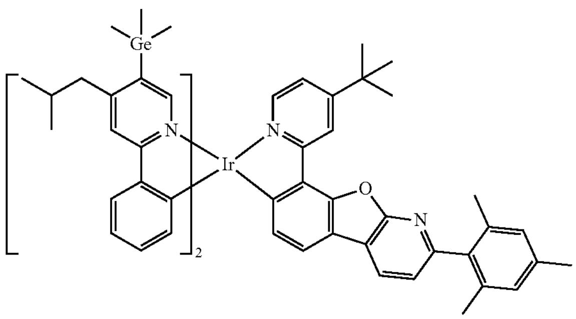
1015
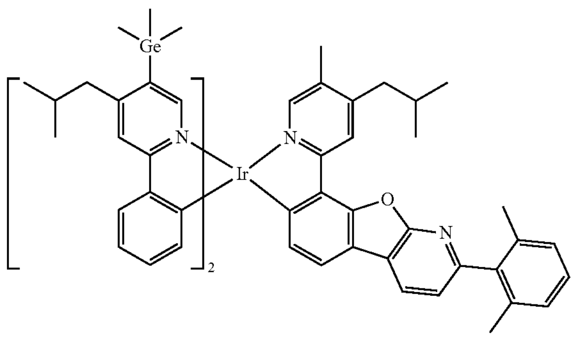
1016
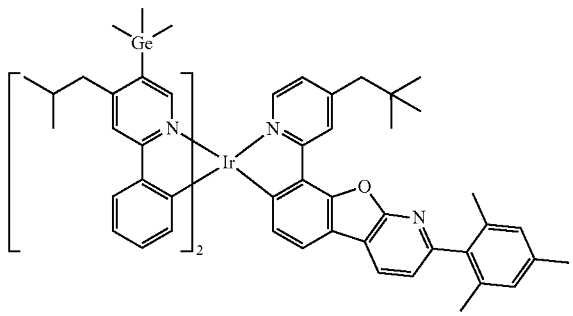
-continued
1017
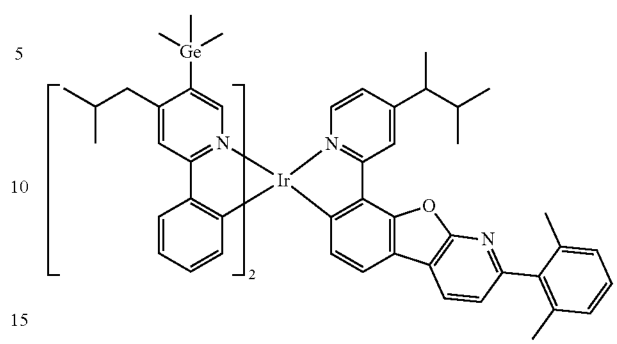
1018
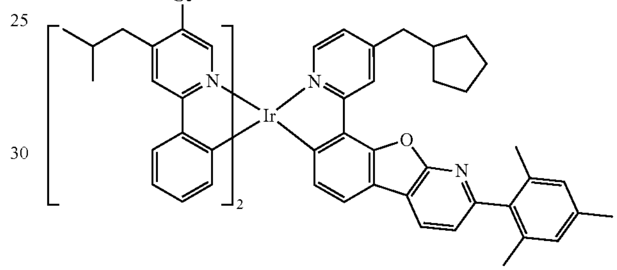
1019
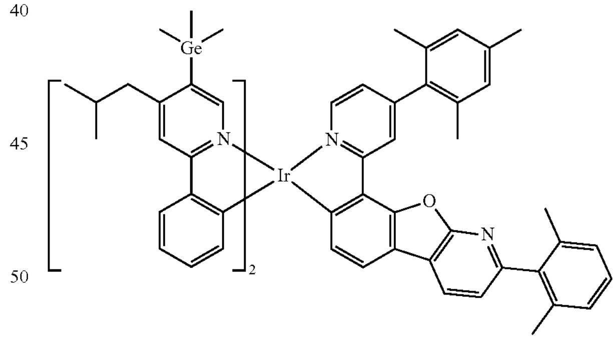
1020
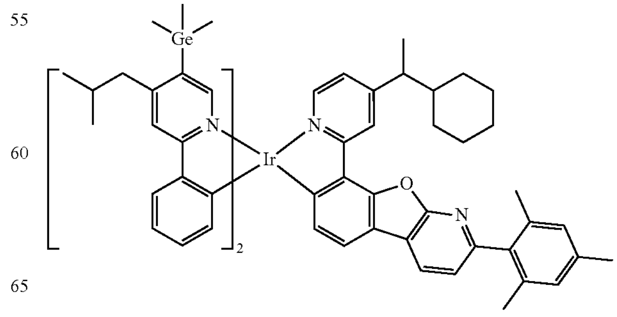

-continued
1021
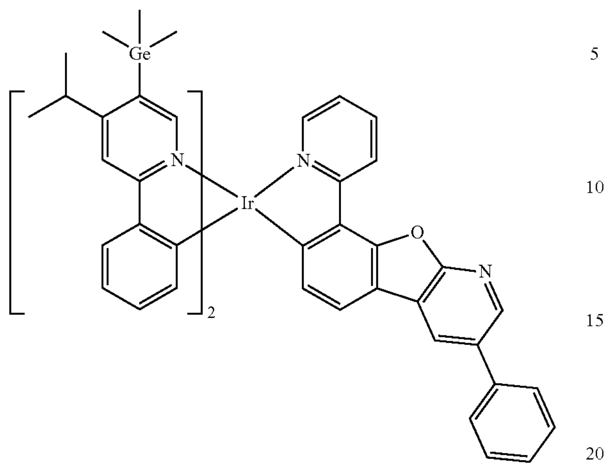
1022
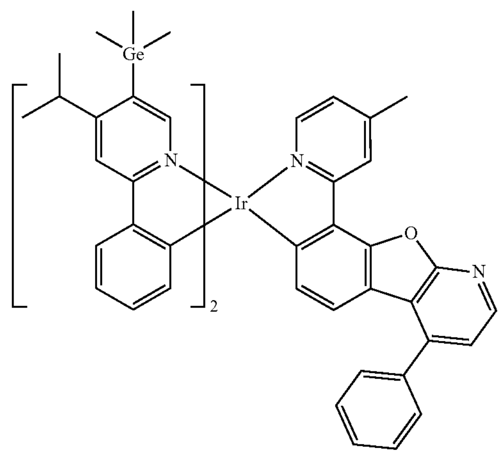
1023
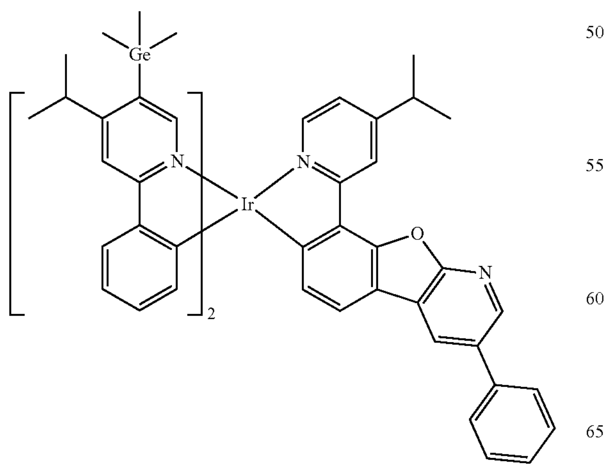
-continued
1024
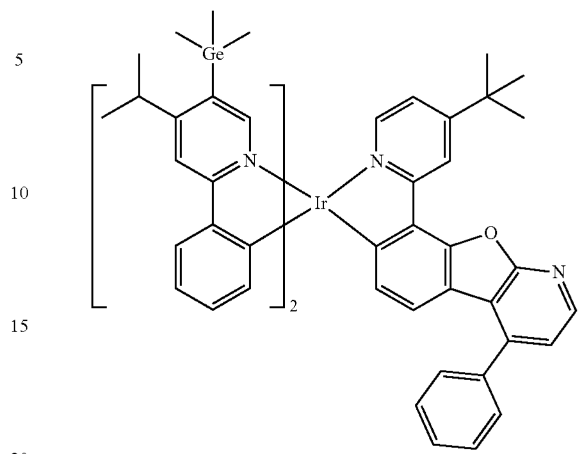
1025
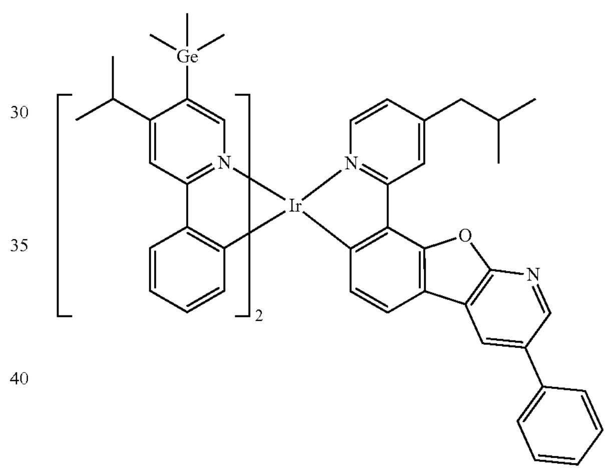
1026
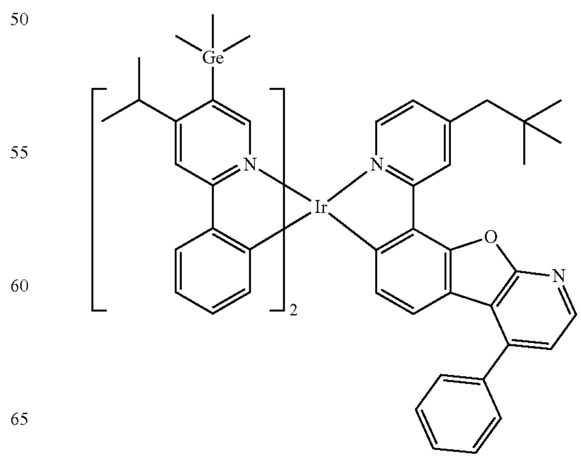

-continued
1027
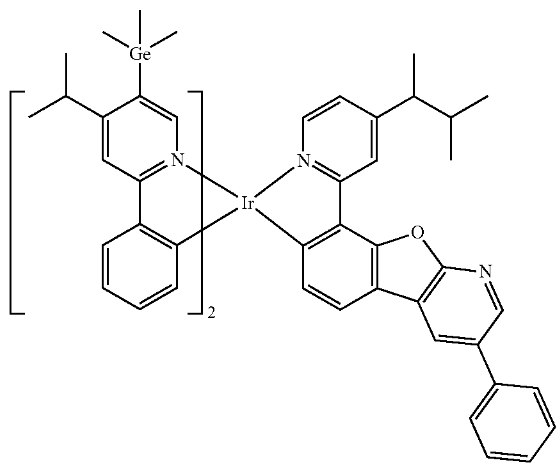
1028
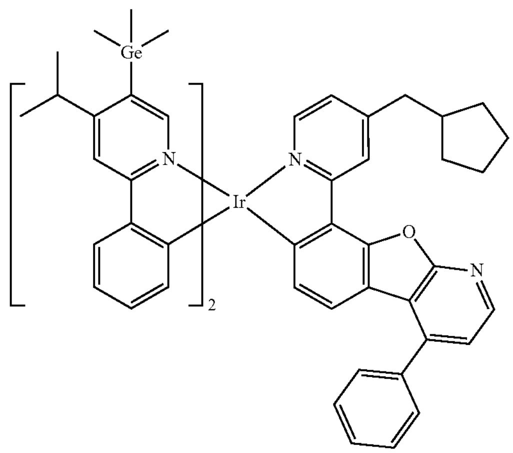
1029
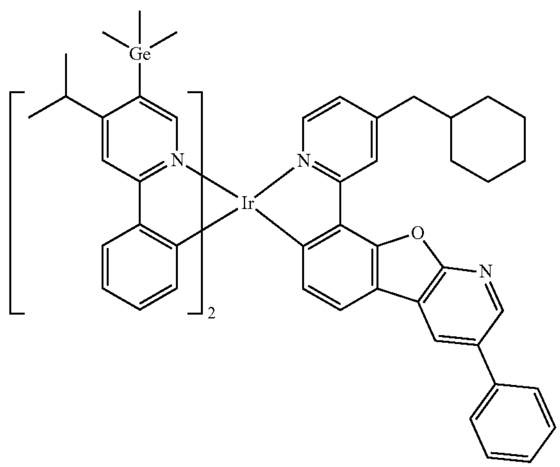
-continued
1030
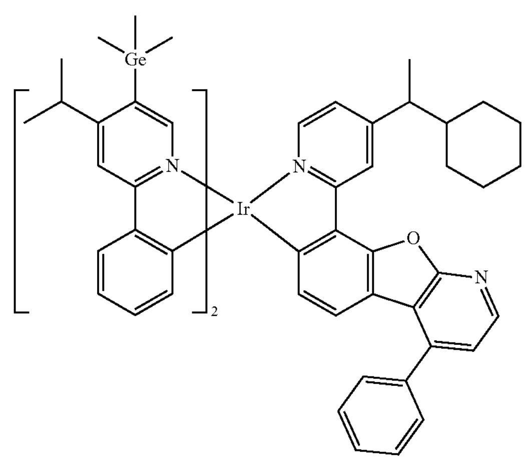
1031
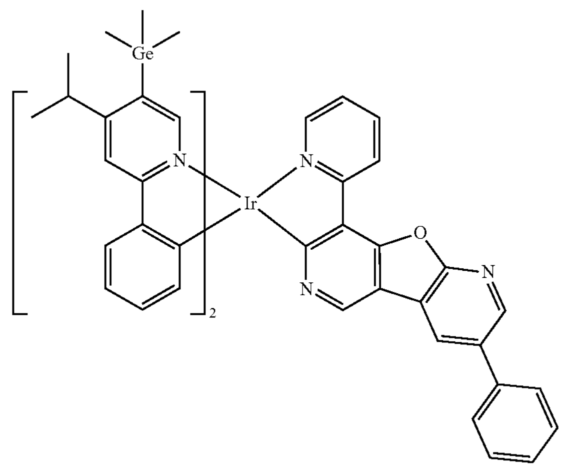
1032
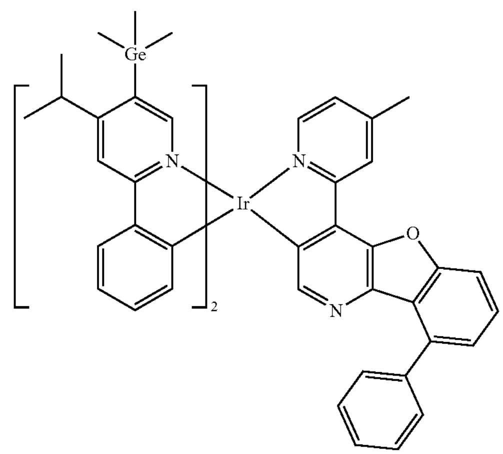

-continued
1033
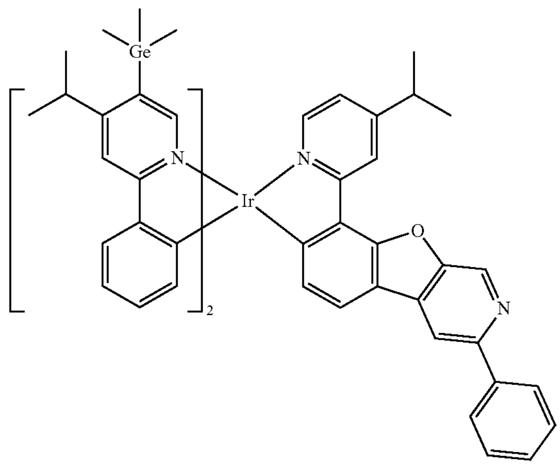
1034
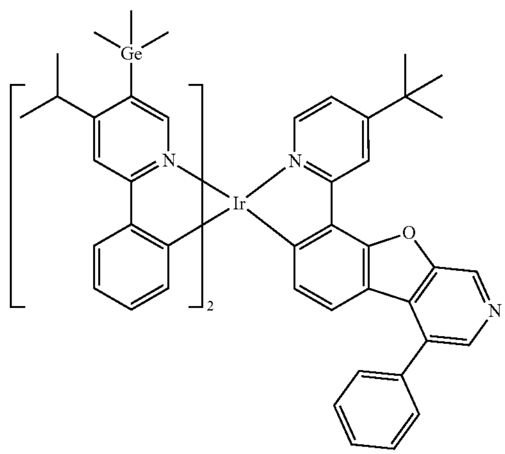
1035
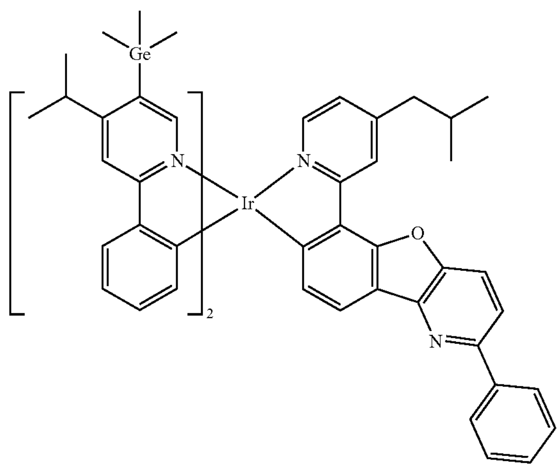
-continued
1036
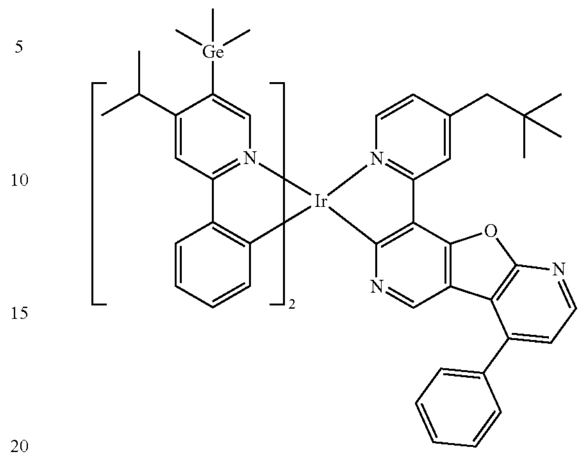
1037
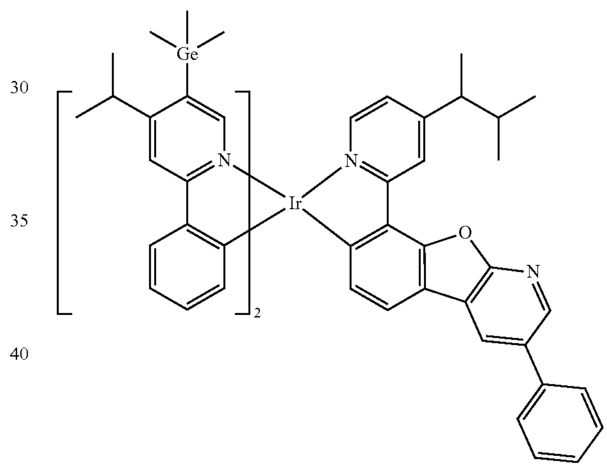
1038
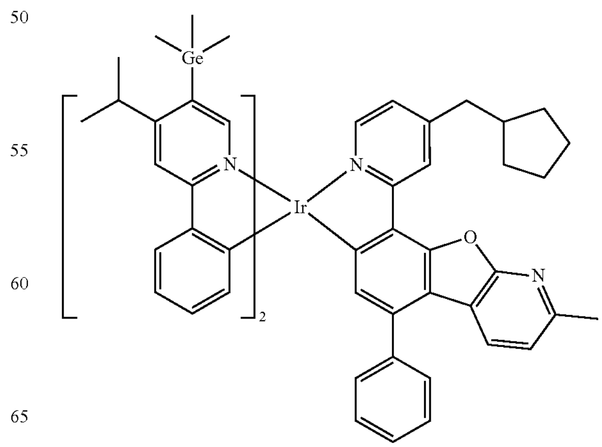

-continued
1039
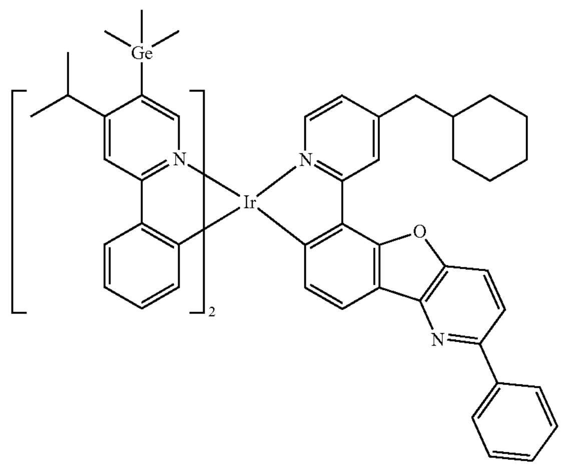
1040
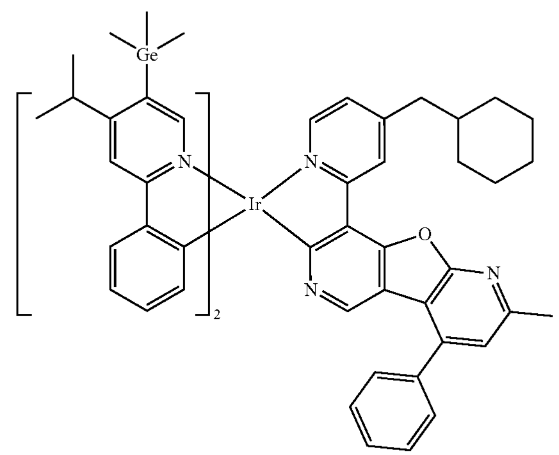
1041
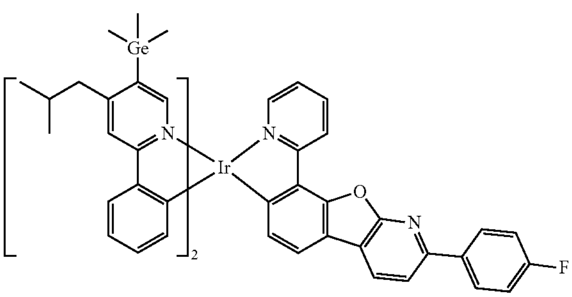
1042
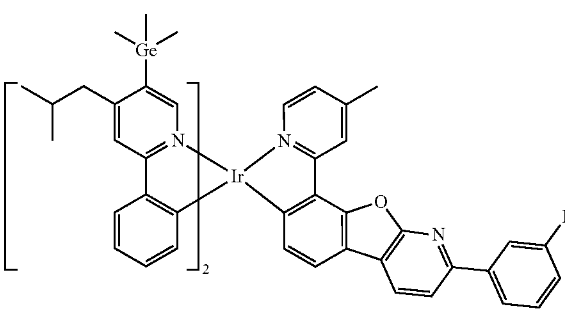
-continued
1043
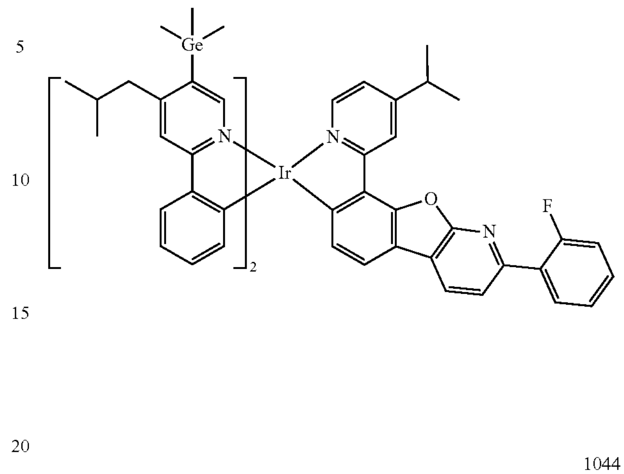
1044
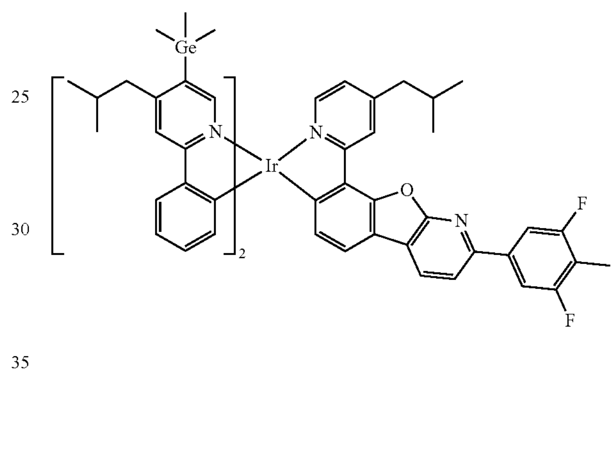
1045
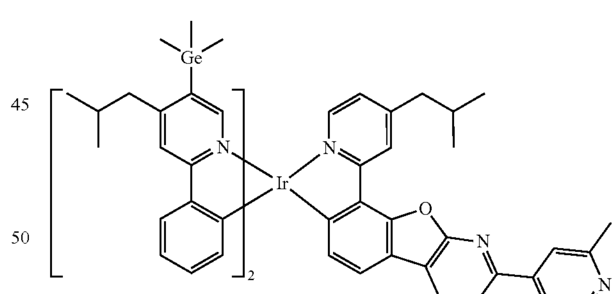
1046
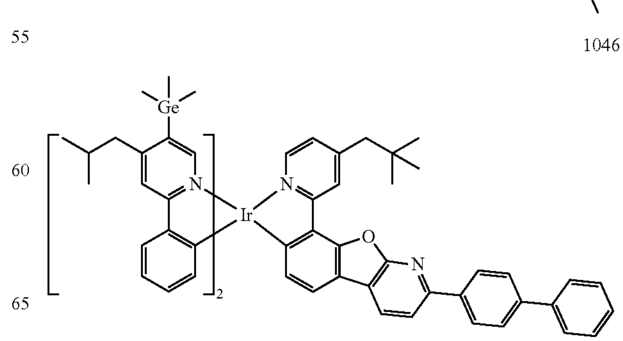

-continued
1047
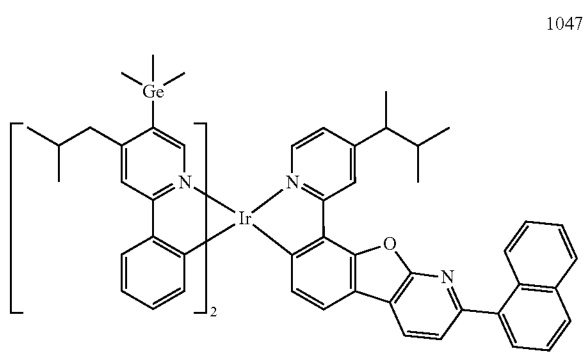
1048
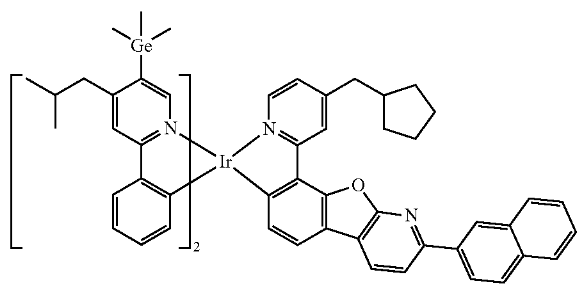
1049
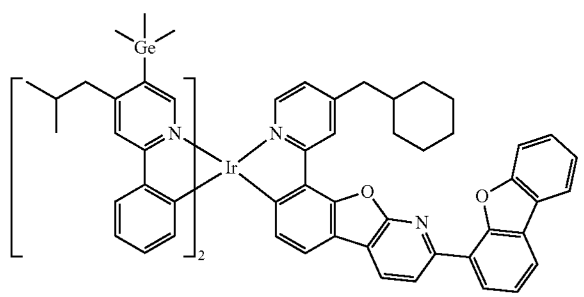
1050
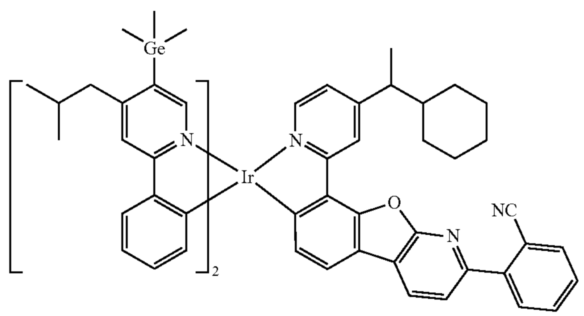
1051
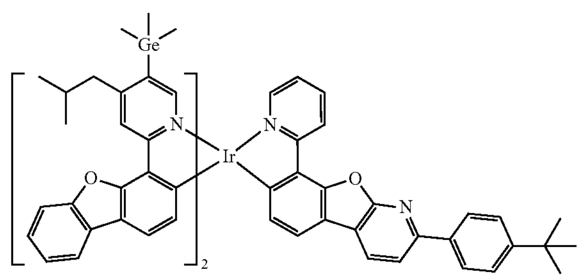
-continued
1052
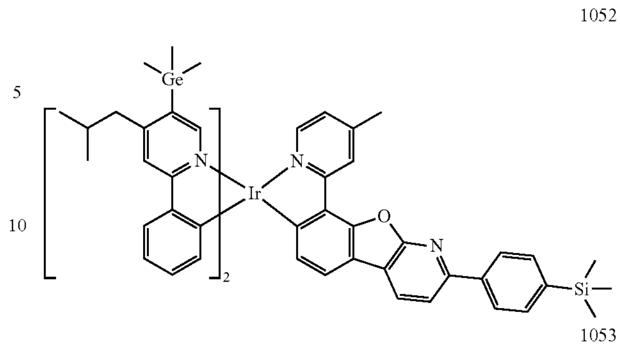
1053
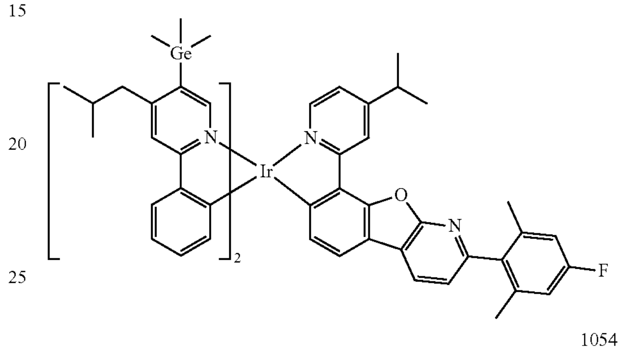
1054
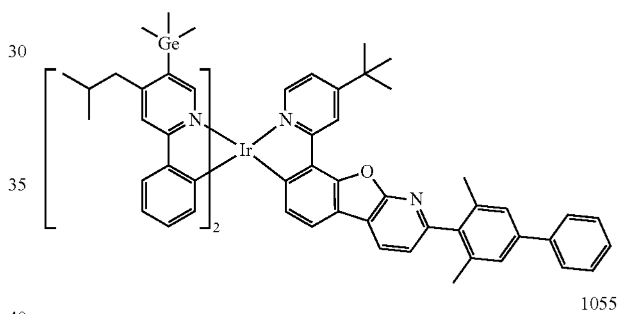
1055
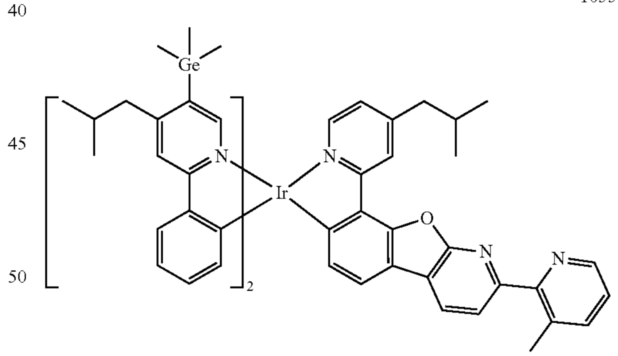
1056
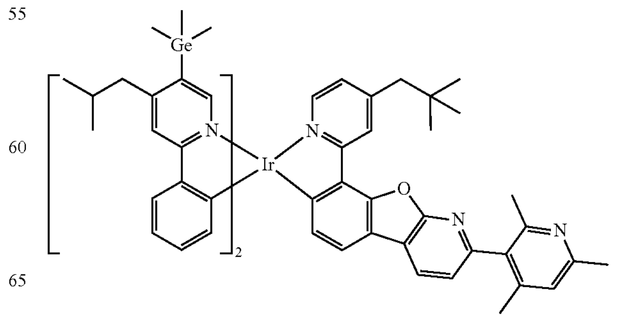

-continued
1057
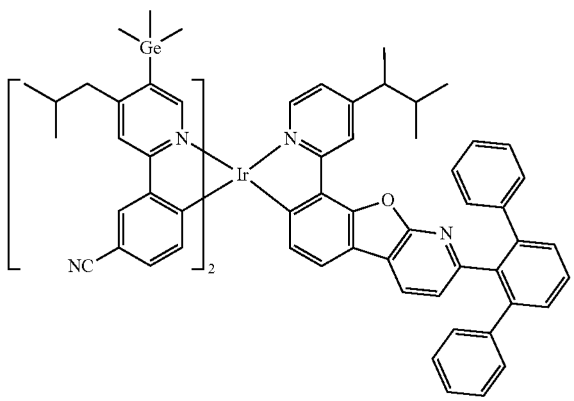
1058
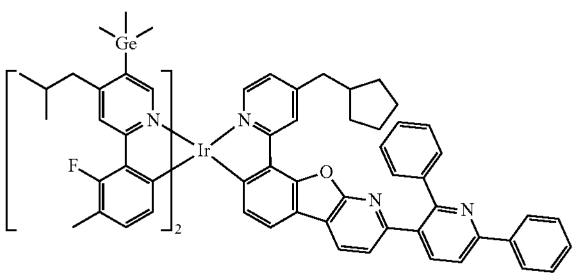
1059
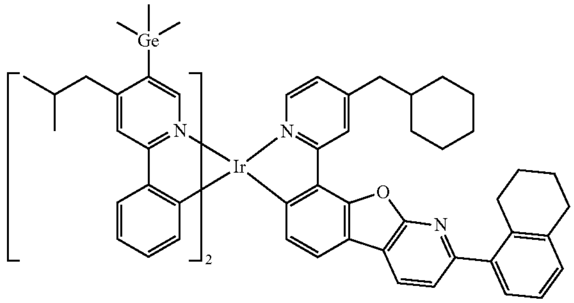
1060
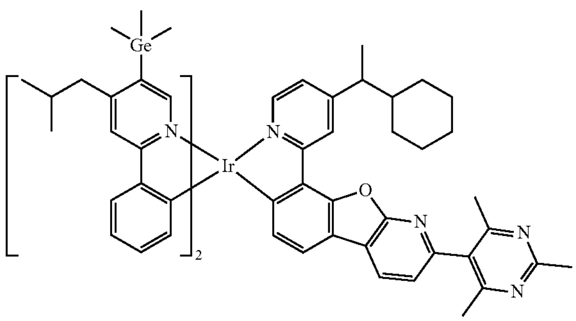
-continued
1061
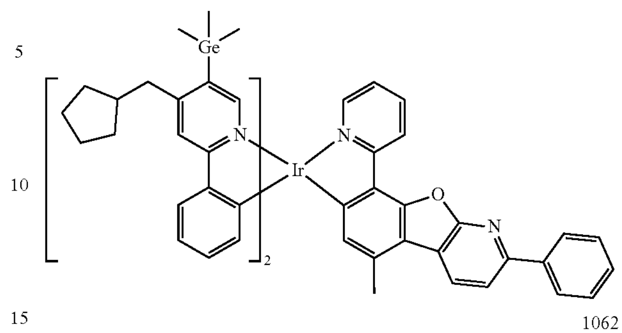
1062
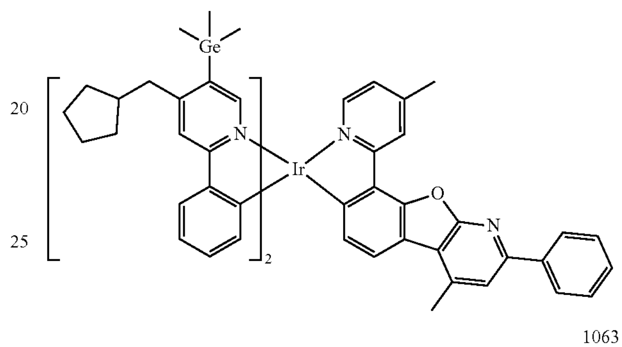
1063
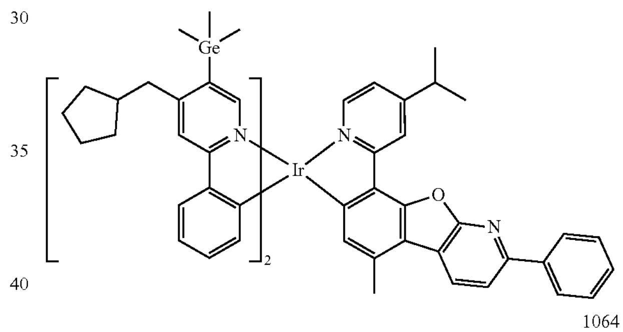
1064
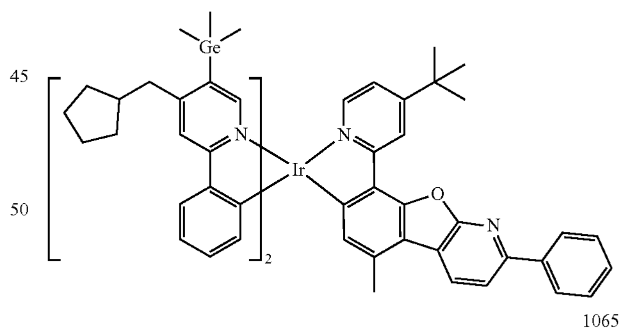
1065
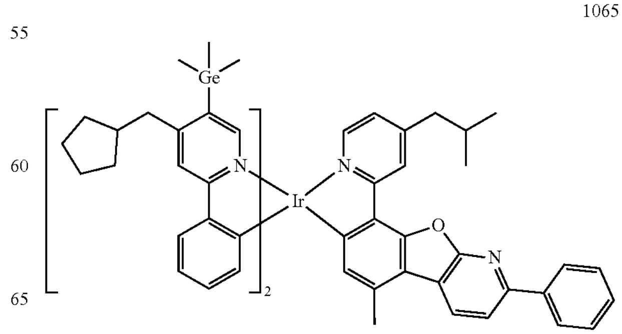

-continued
1066
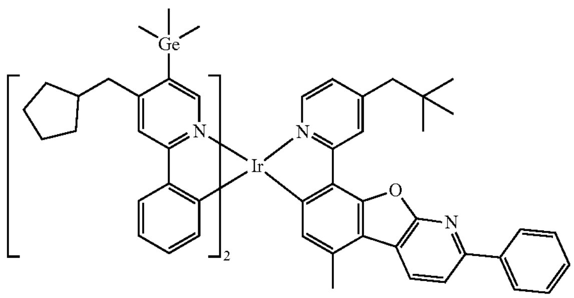
1067
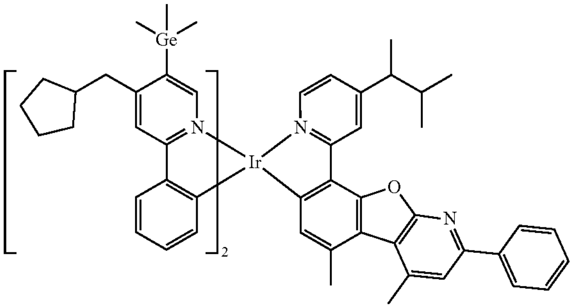
1068
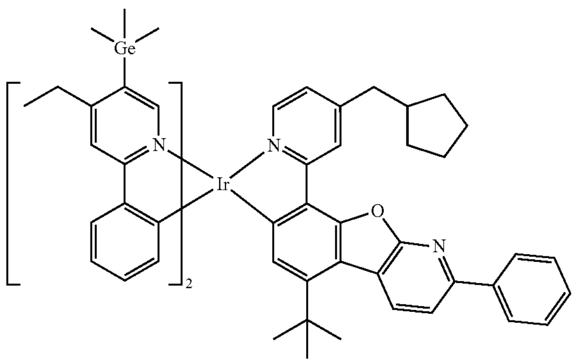
1069
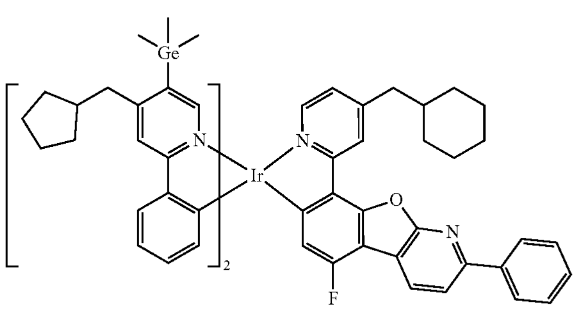
-continued
1070
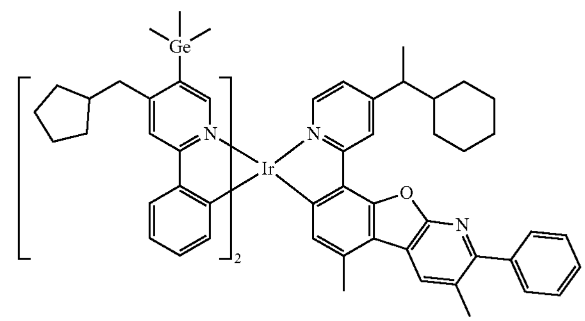
1071
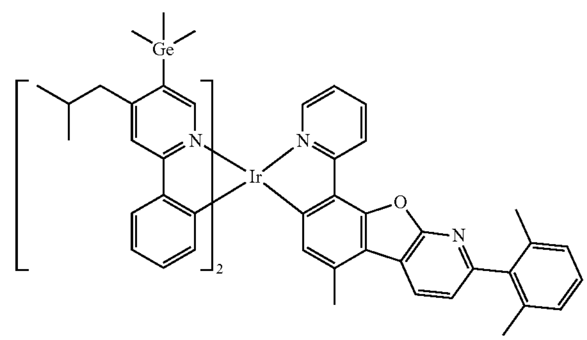
1072
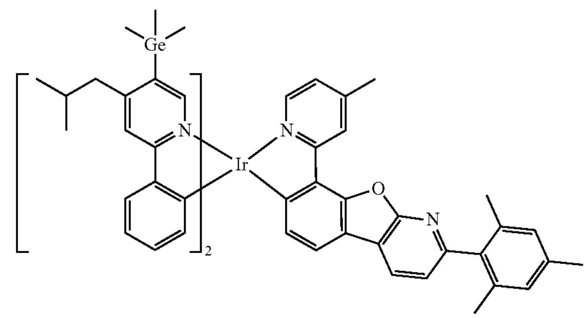
1073
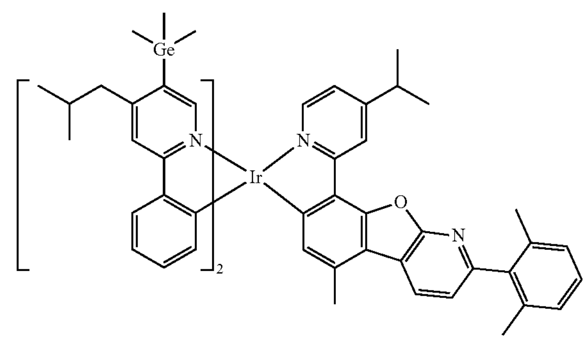

-continued
1074
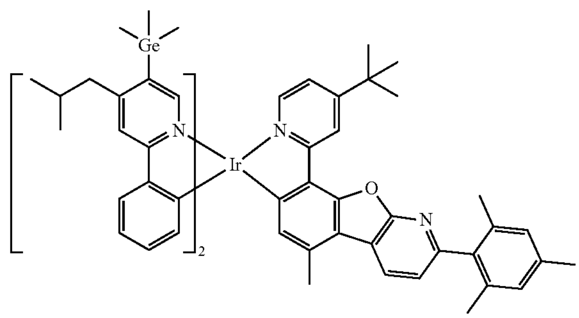
1075
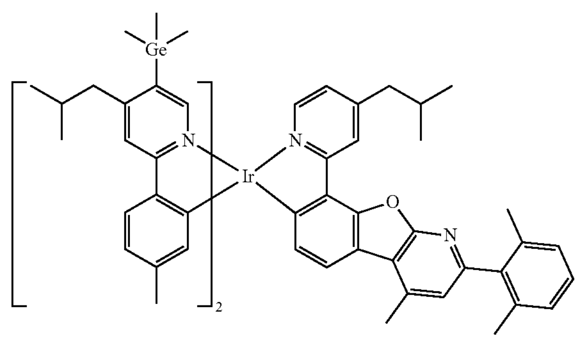
1076
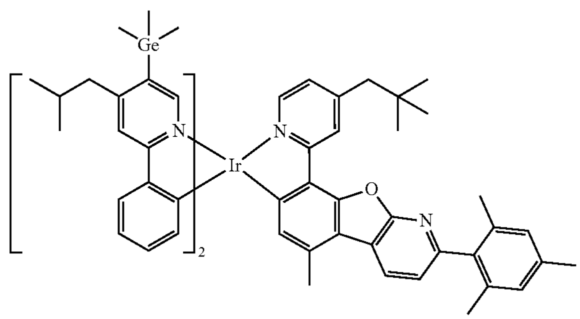
1077
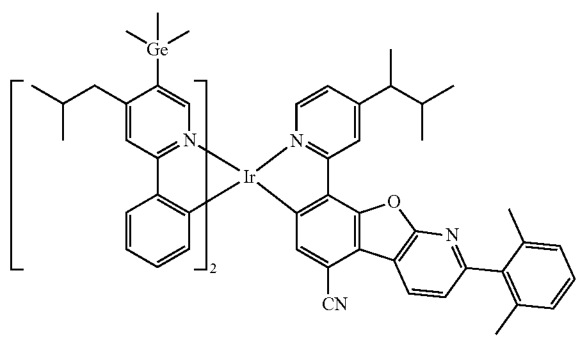
-continued
1078
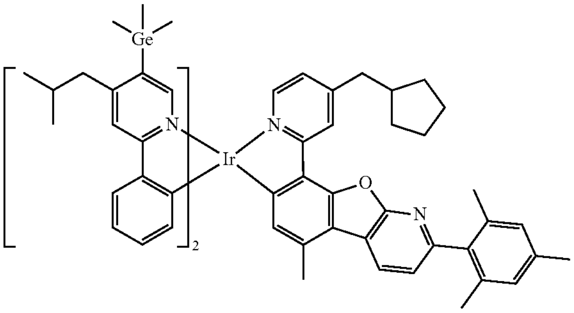
1079
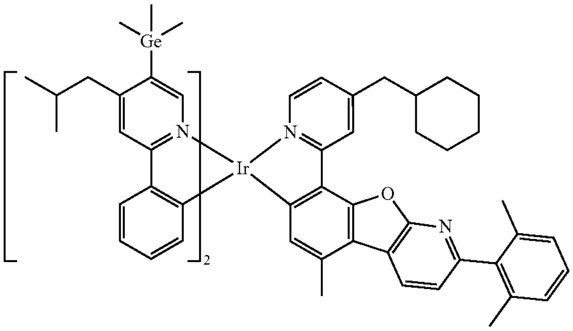
1080
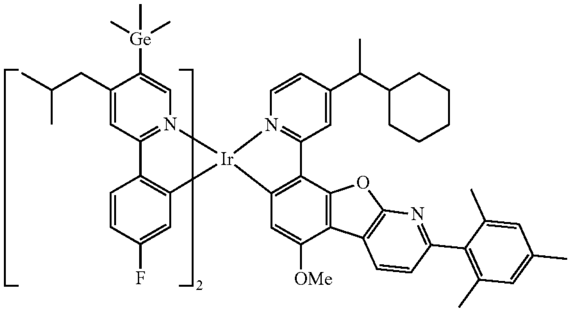
1081
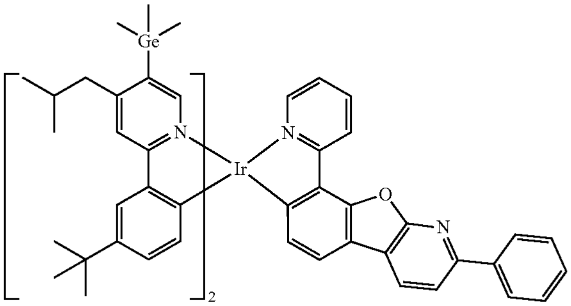

-continued
1082
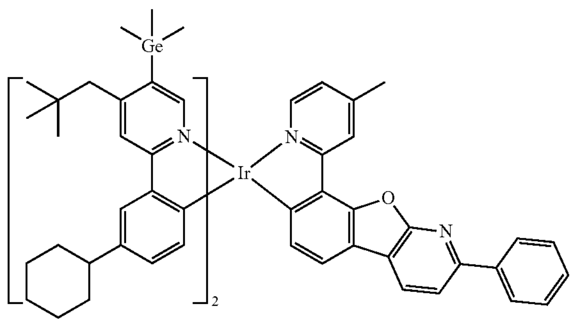
1083
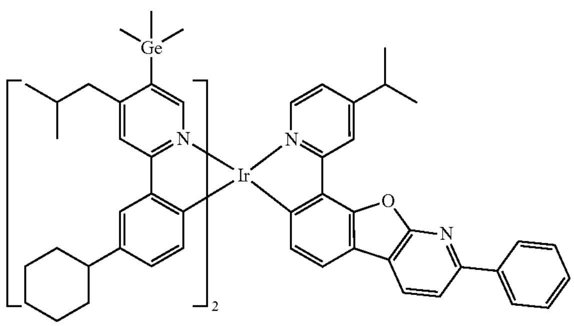
1084
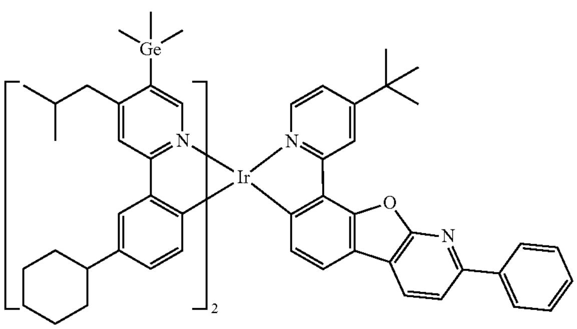
1085
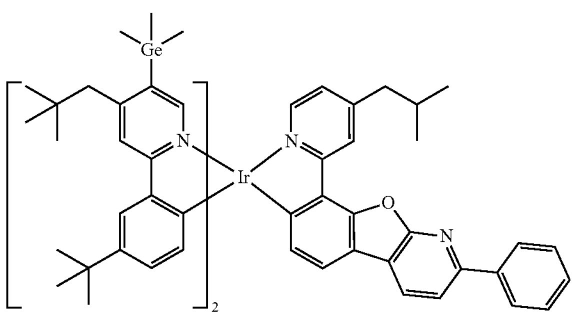
-continued
1086
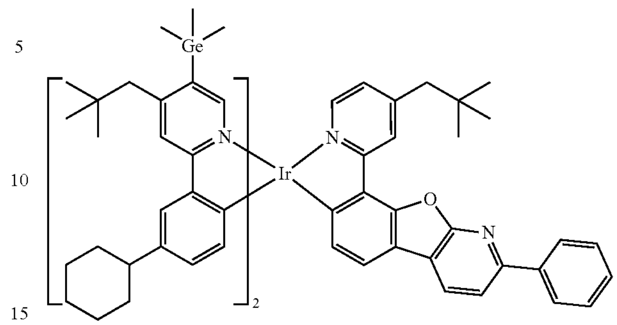
1087
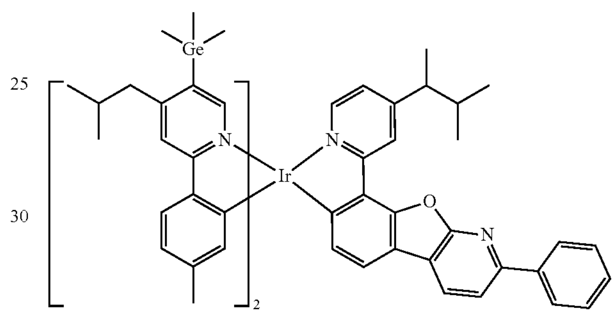
1088
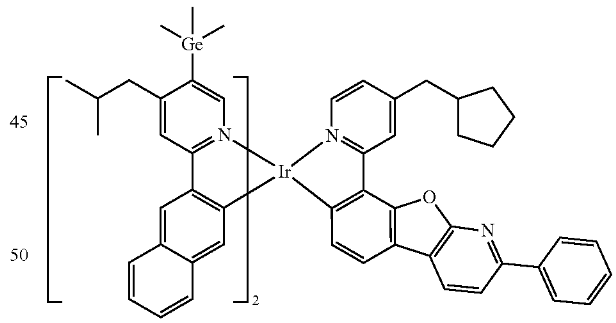
1089
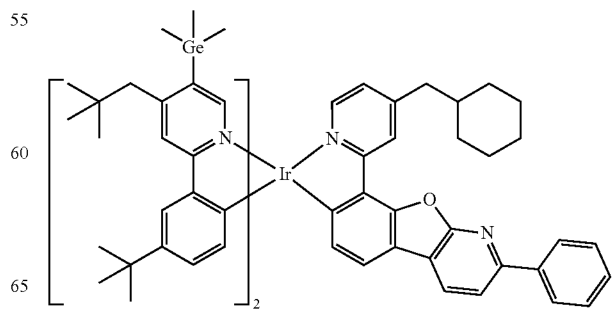

-continued
1090
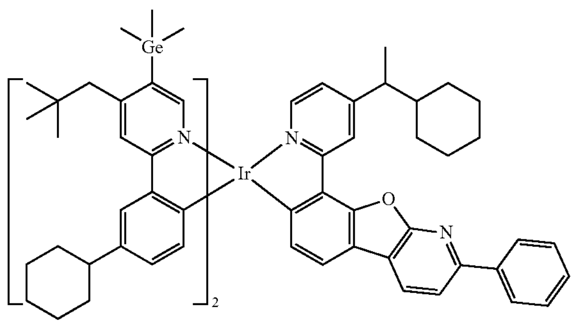
1091
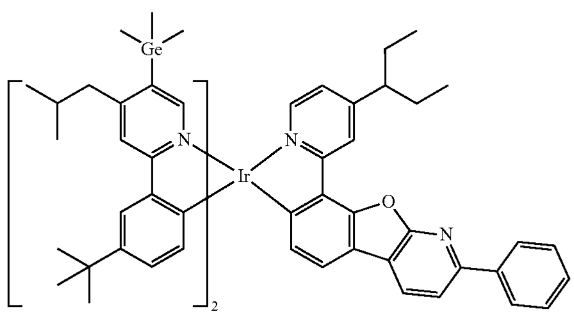
1092
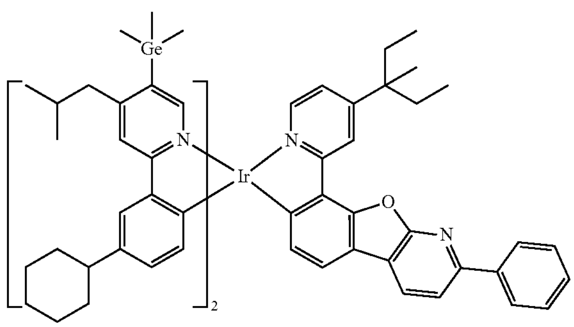
1093
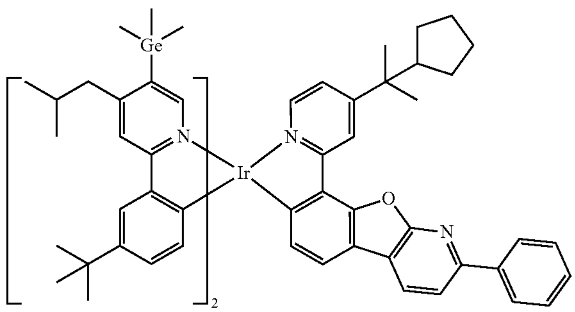
-continued
1094
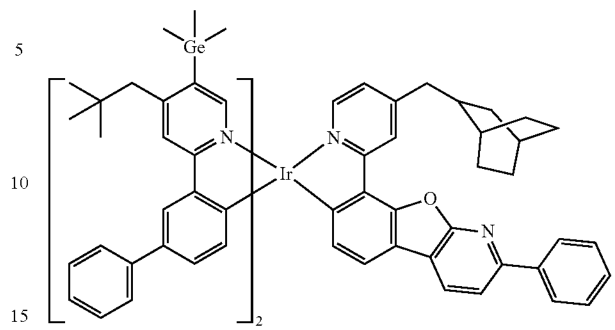
1095
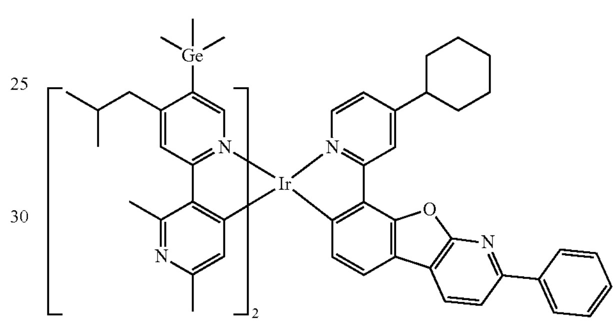
1096
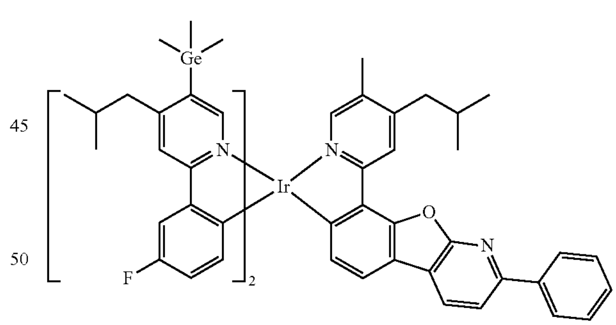
1097
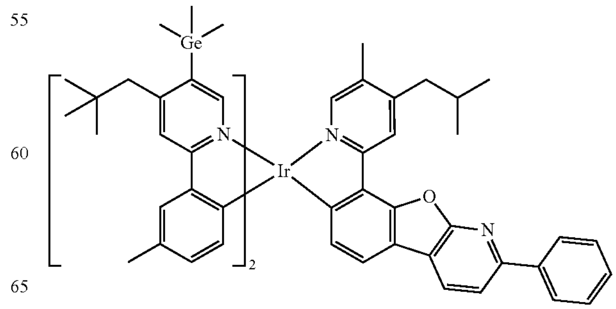

-continued
1098
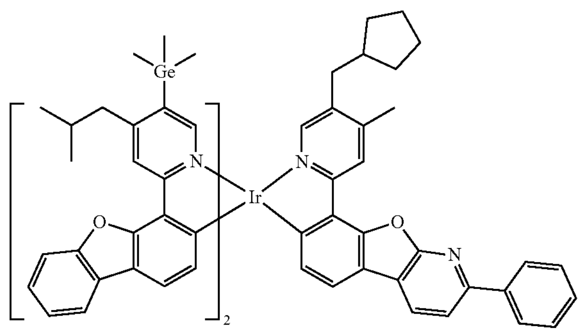
1099
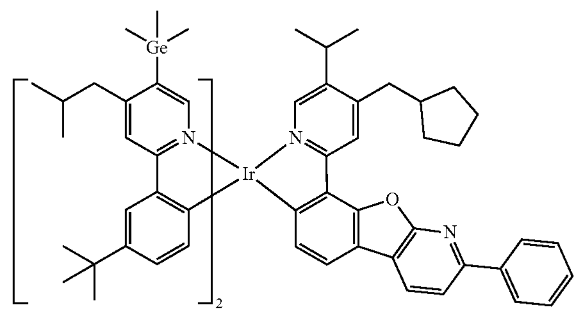
1100
1101
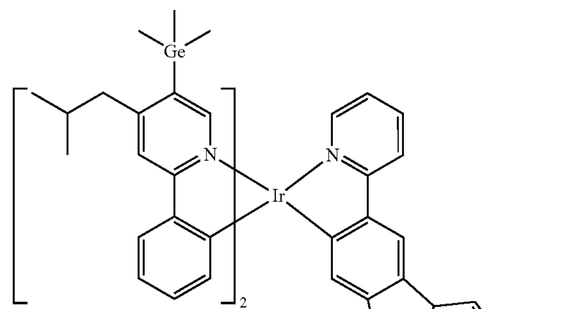
-continued
1102
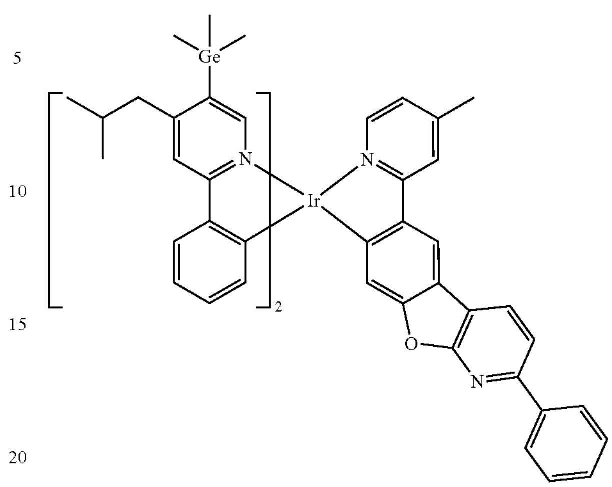
1103
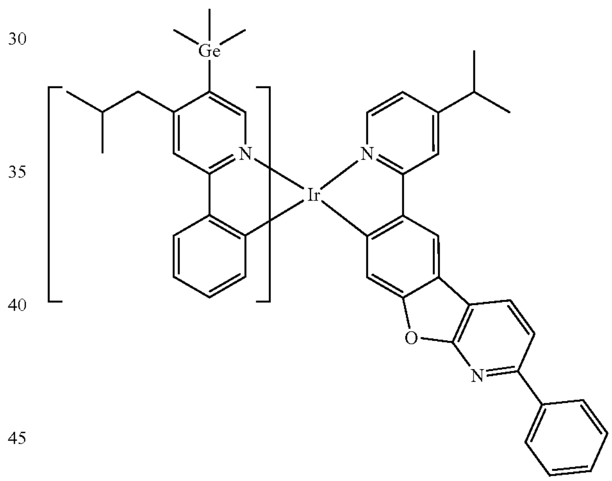
1104
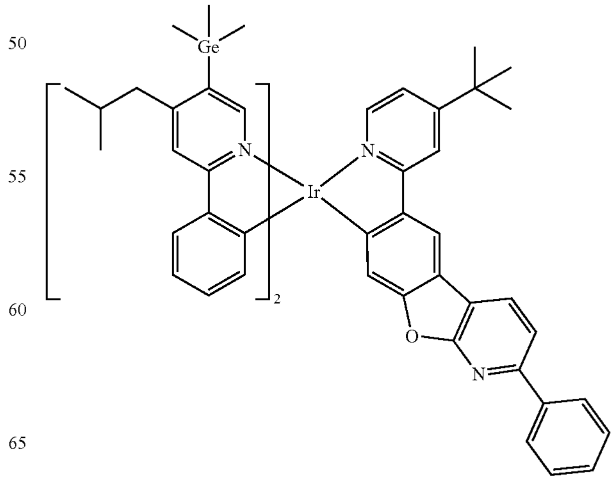

-continued
1105
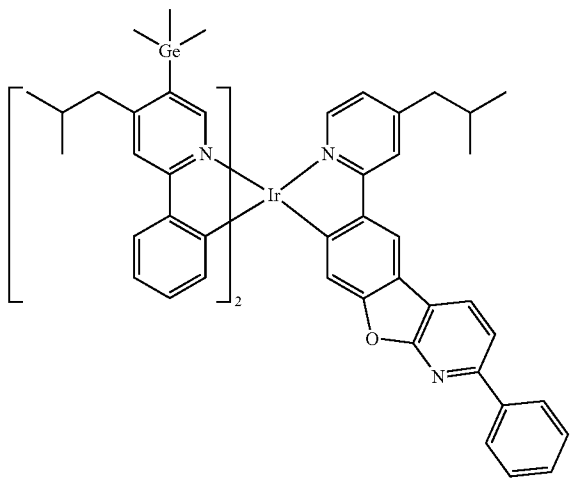
1106
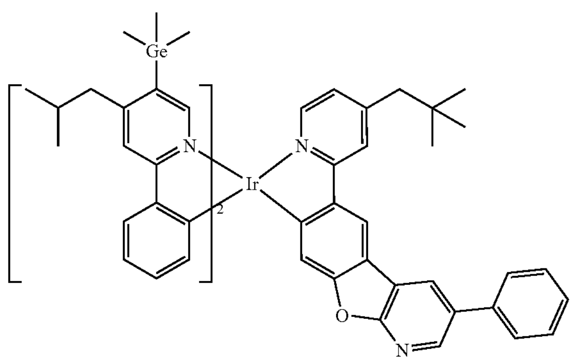
1107
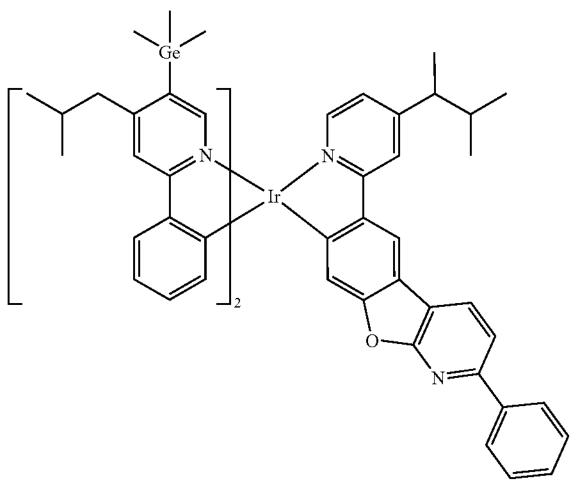
-continued
1108
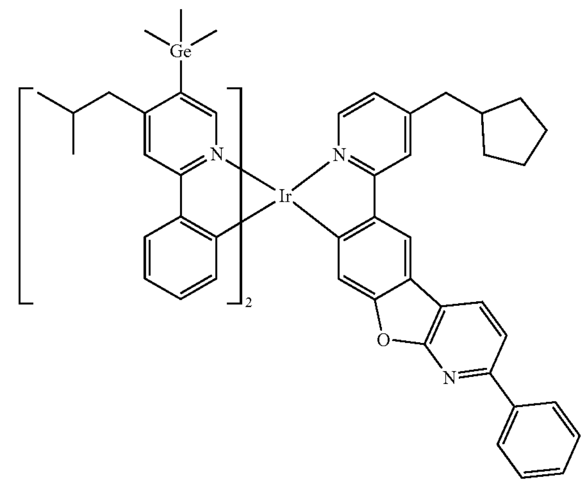
1109
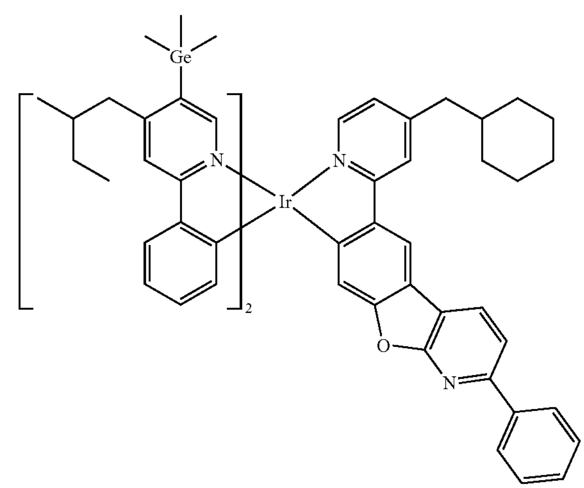
1110
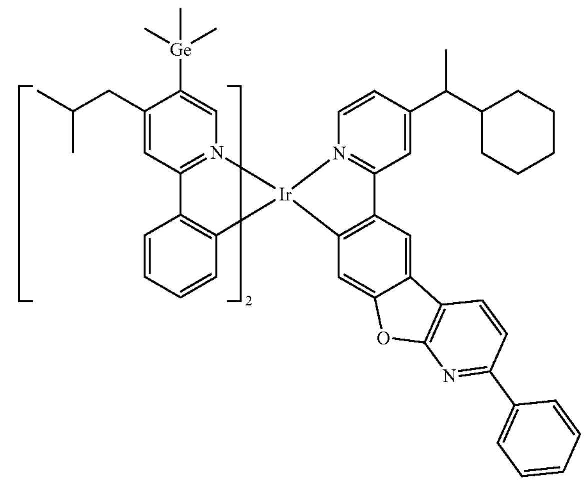

1111
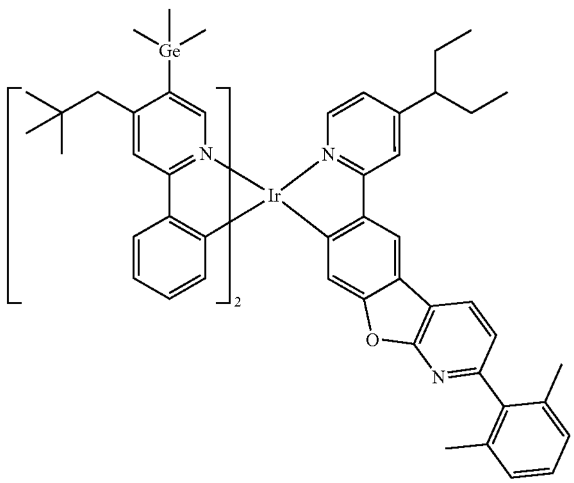
1112
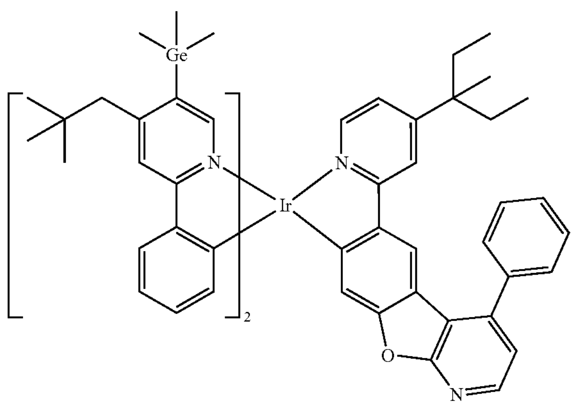
1113
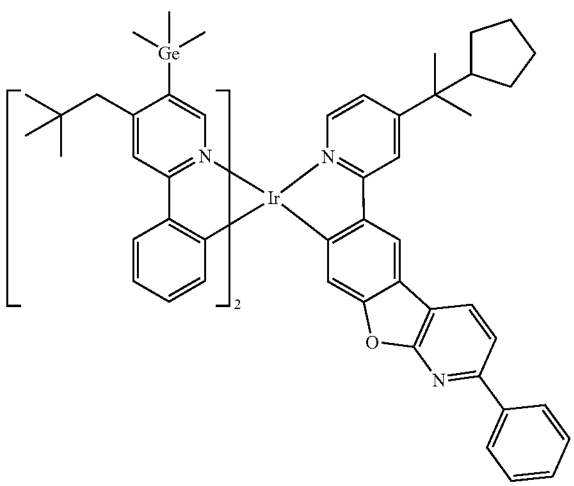
1114
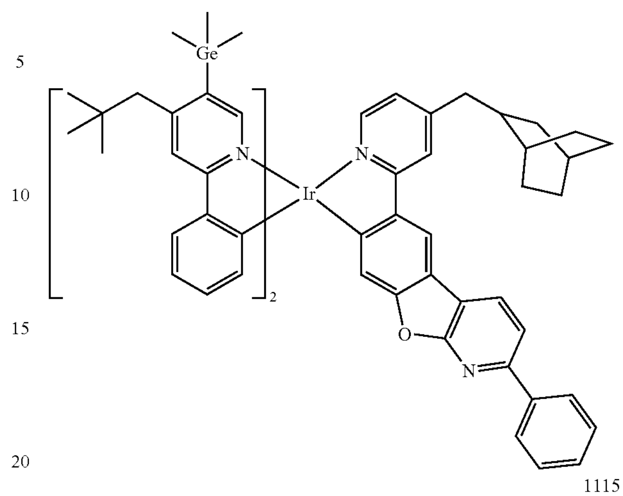
1115
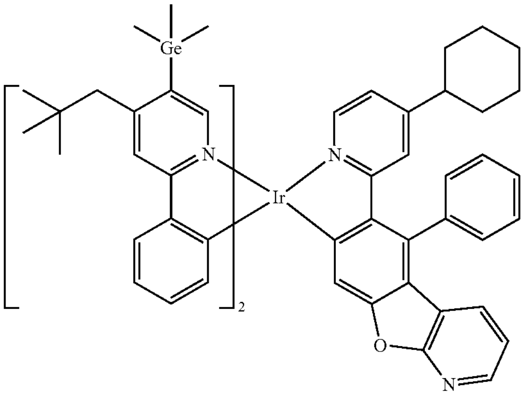
1116
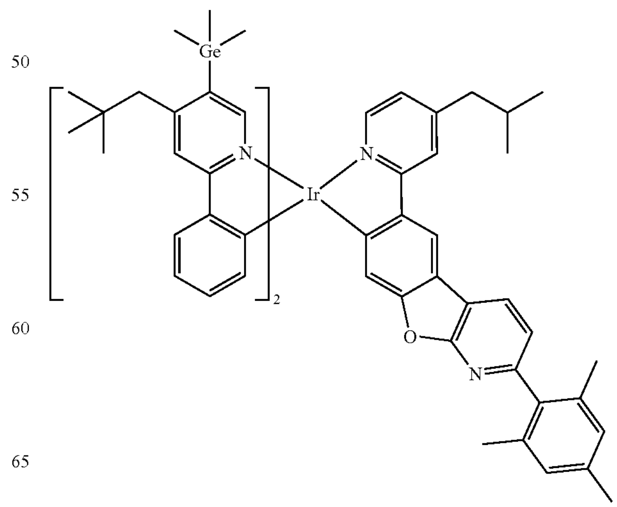

-continued
1117
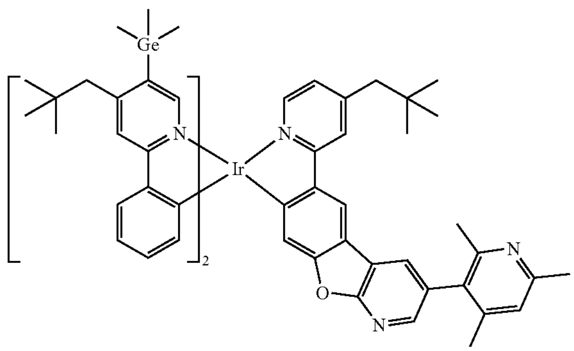
1118
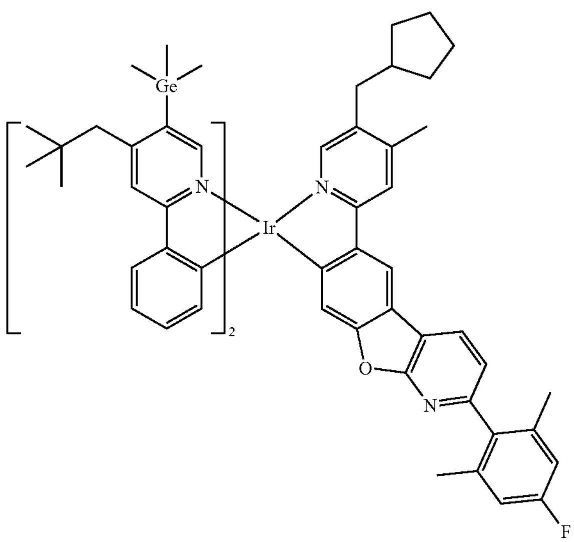
-continued
1119
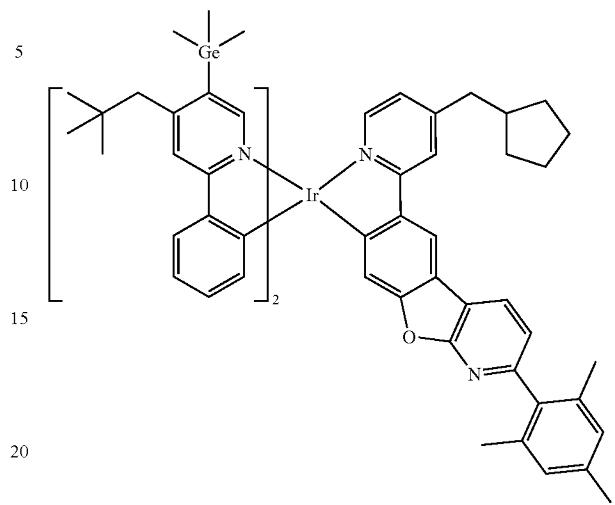
1120
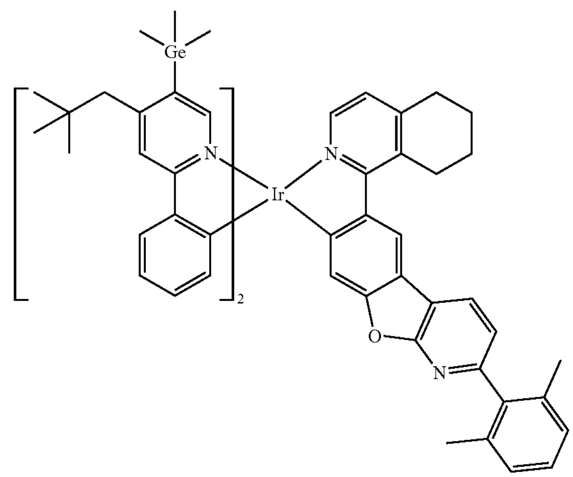

1121
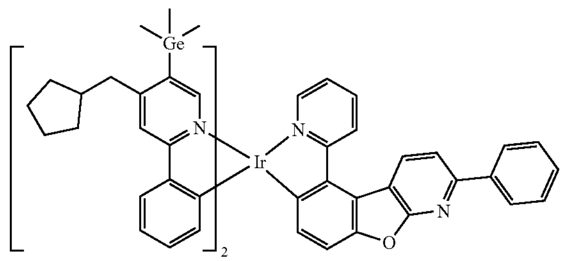
1122
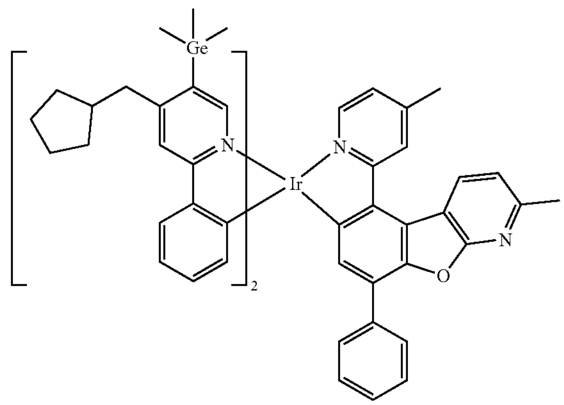
1123
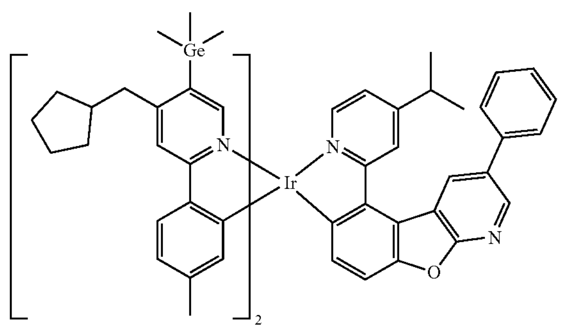
1124
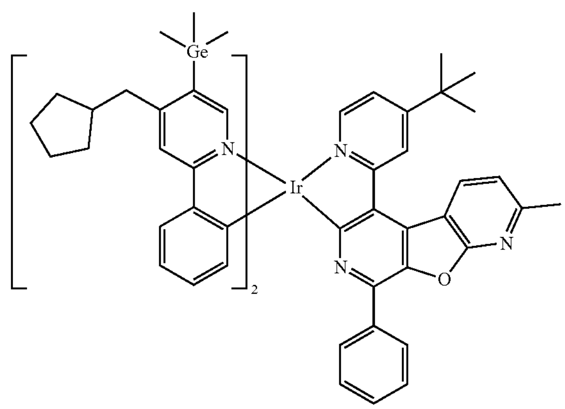
1125
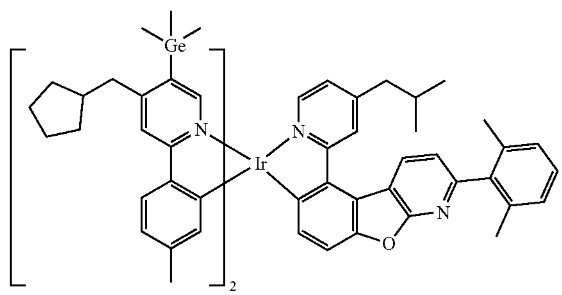
1126
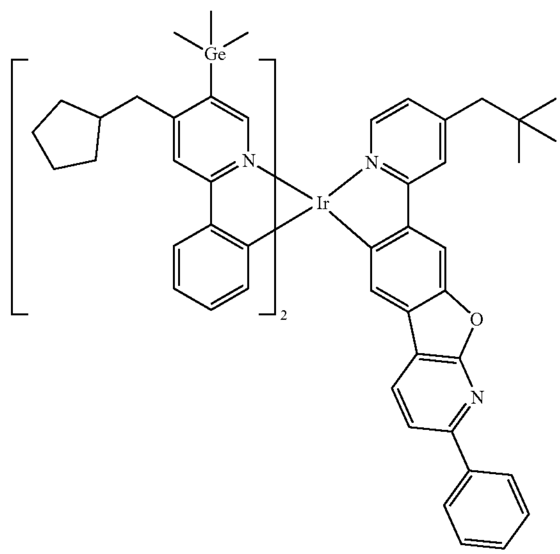

-continued
1127
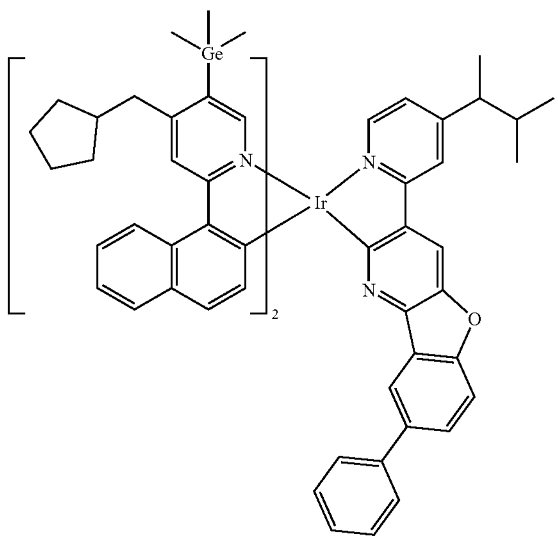
1128
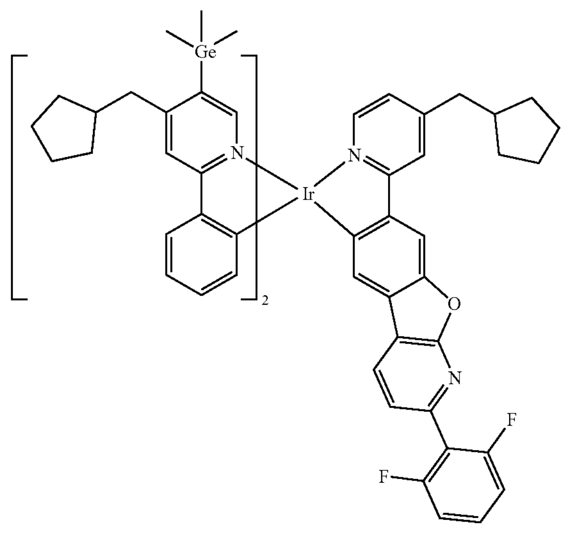
1129
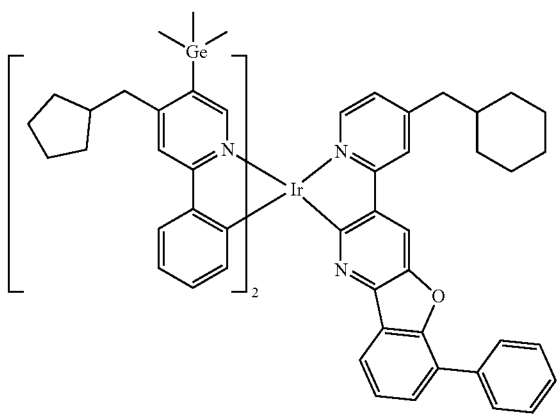
1130
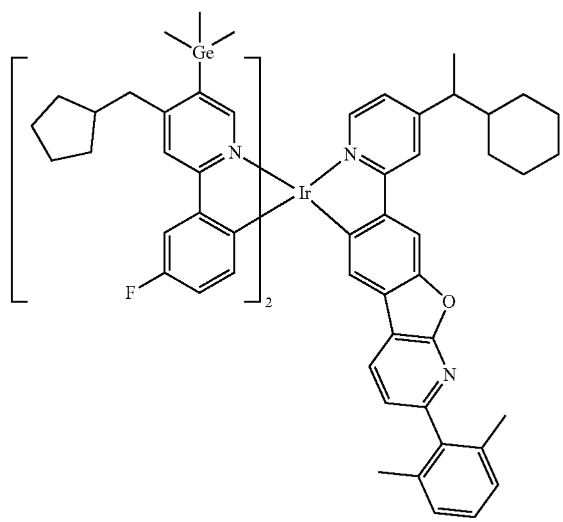
1131
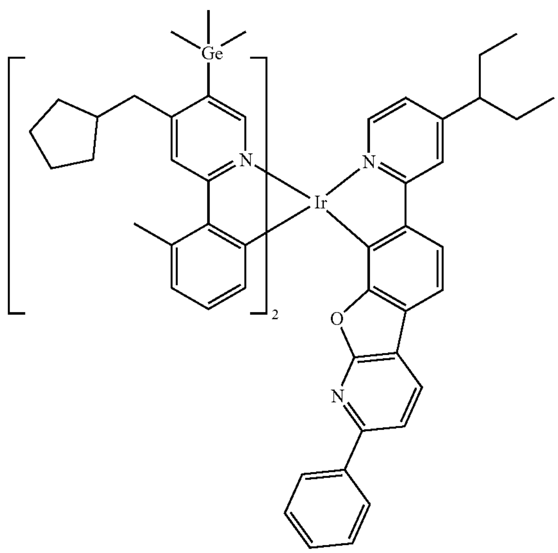
1132
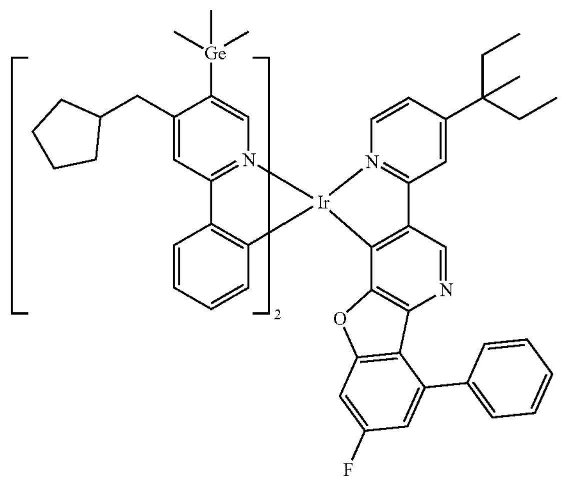

-continued
1133
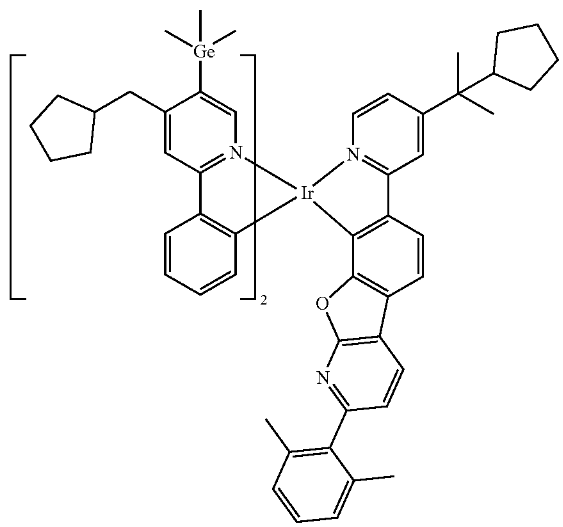
1134
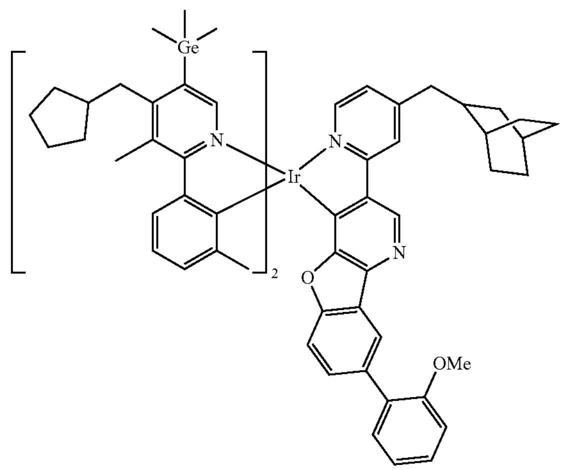
1135
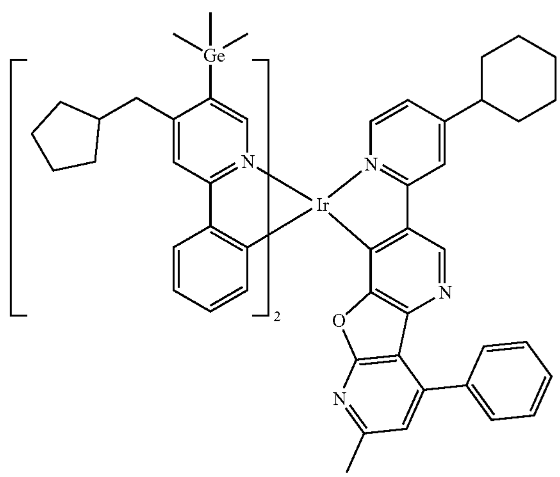
1136
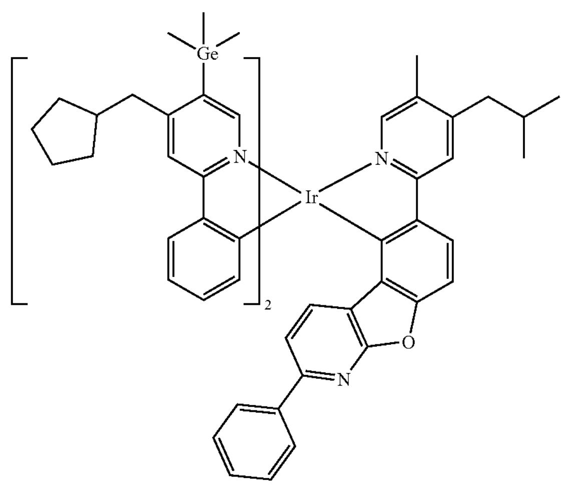
1137
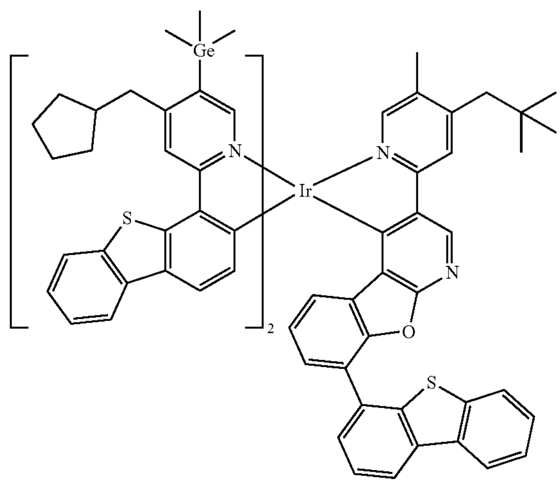
1138
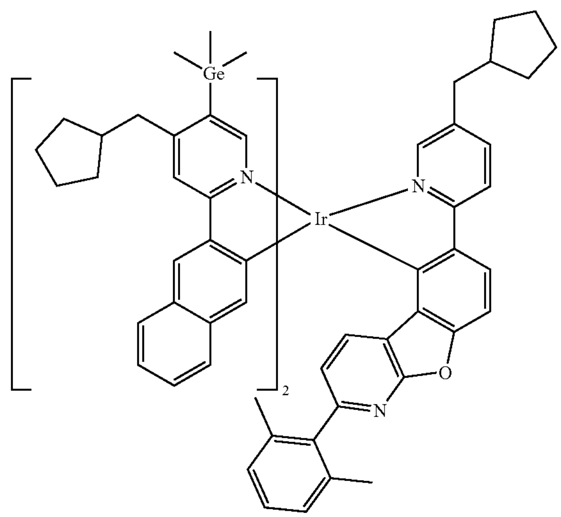

-continued
1139
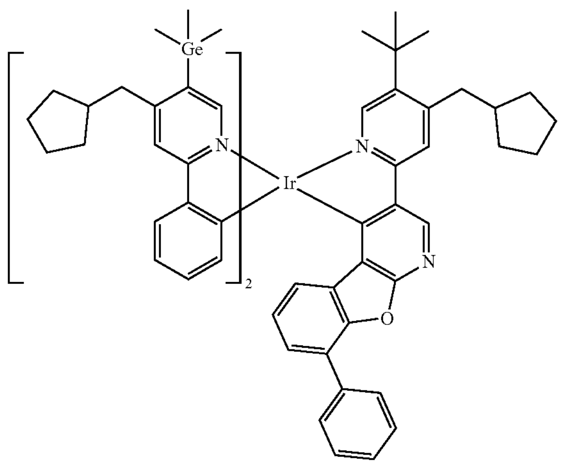
1140
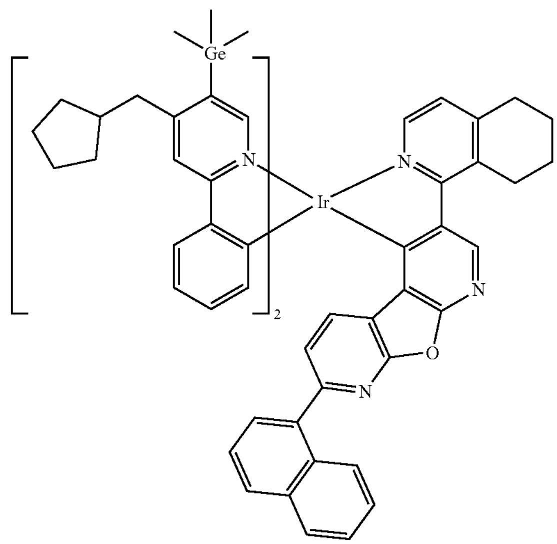
1141
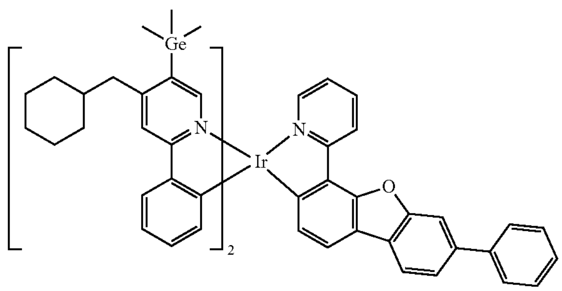
1142
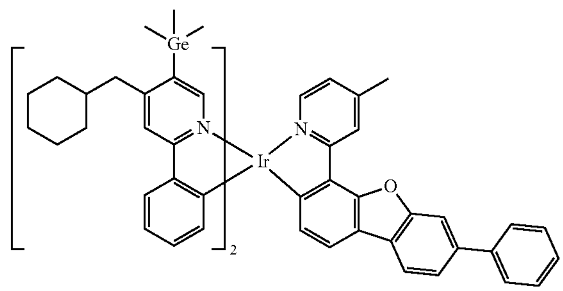
1143
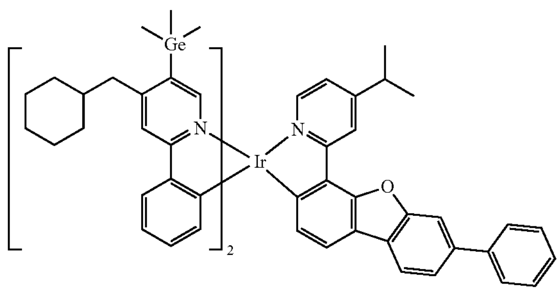
1144
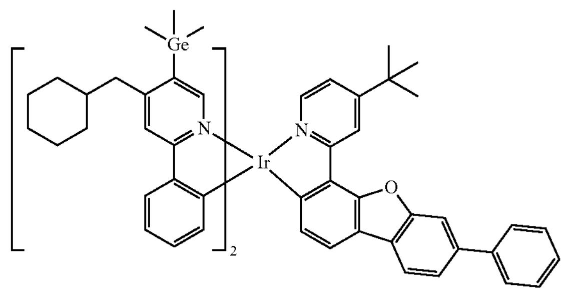
1145
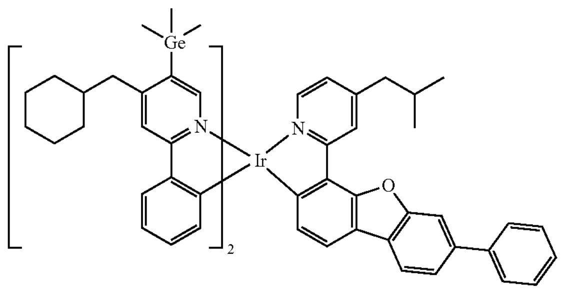
1146
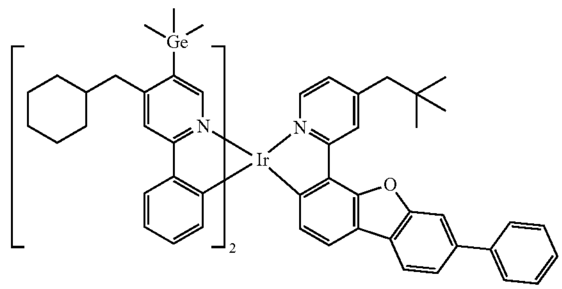

-continued
1147
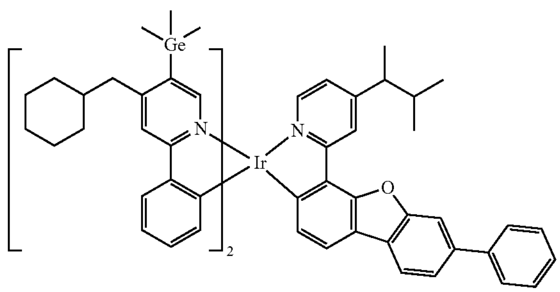
1148
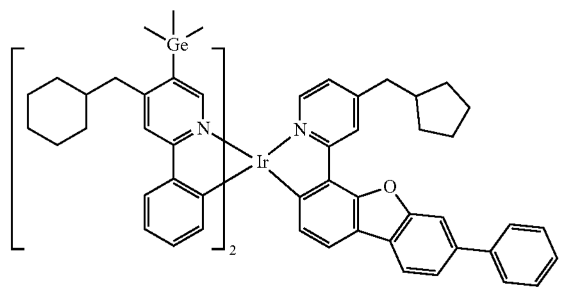
1149
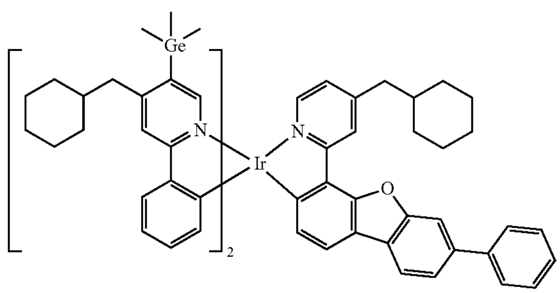
1150
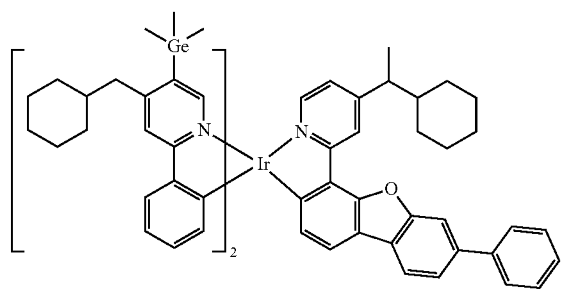
1151
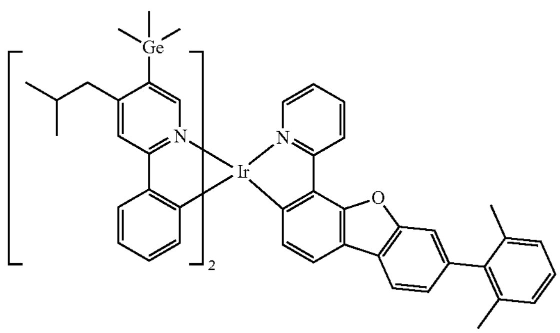
1152
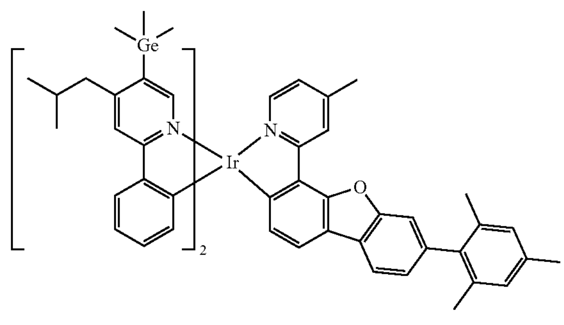
1153
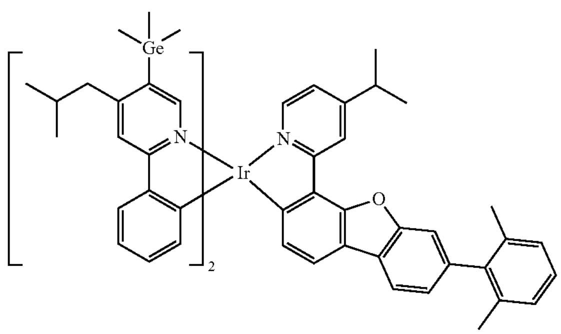
1154
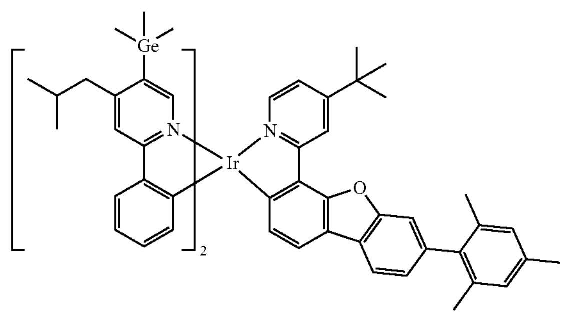

-continued
1155
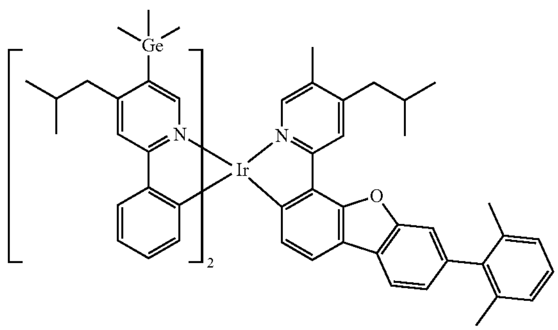
1156
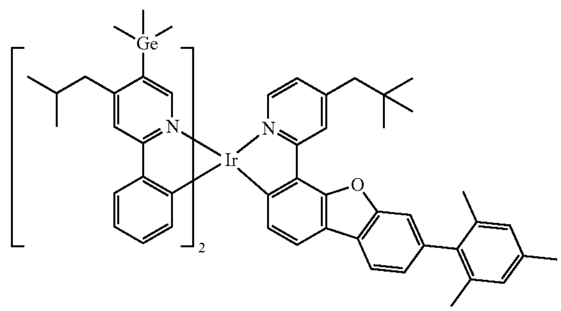
1157
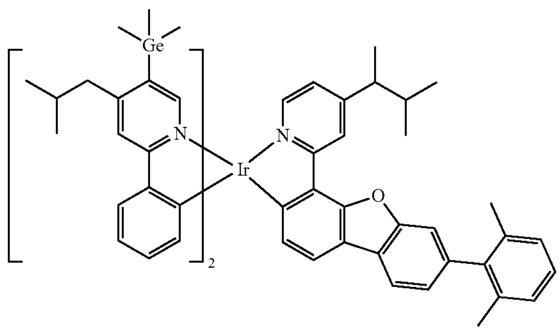
1158
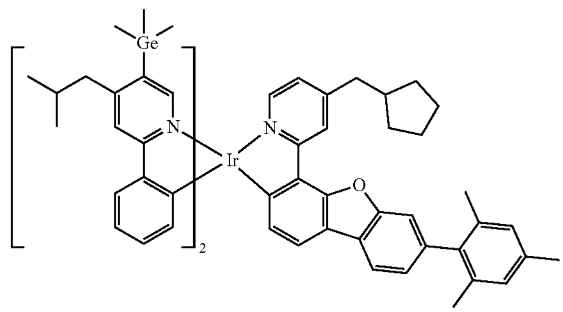
1159
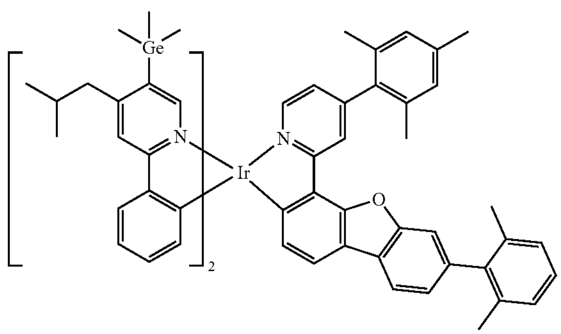
1160
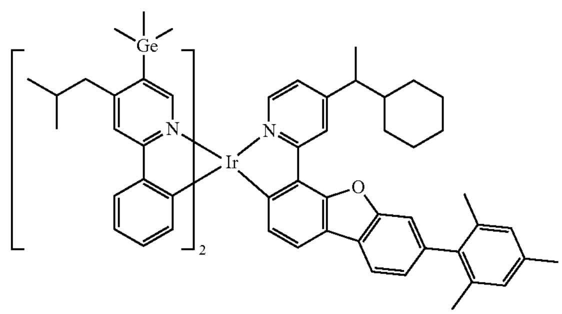
1161
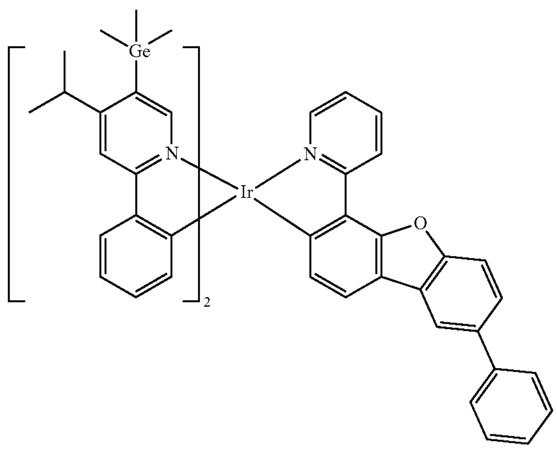
1162
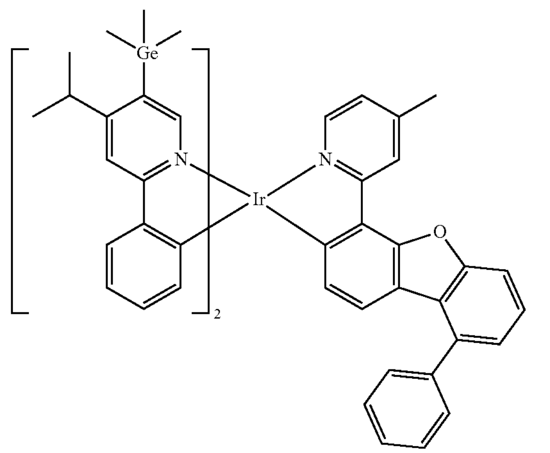

-continued
1163
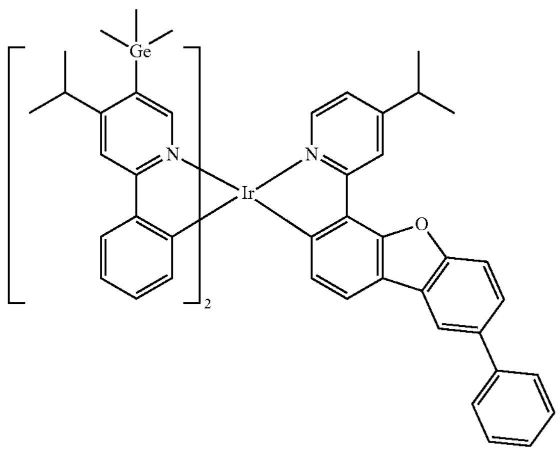
1164
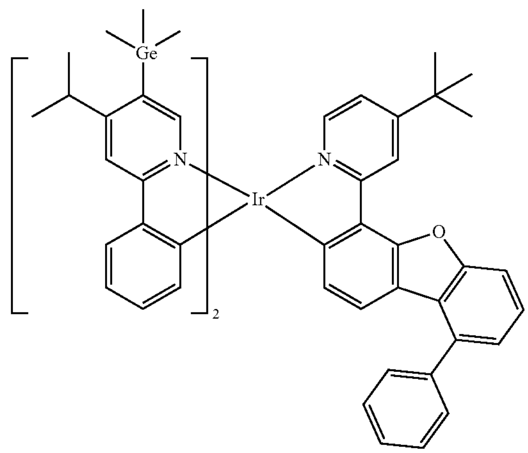
1165
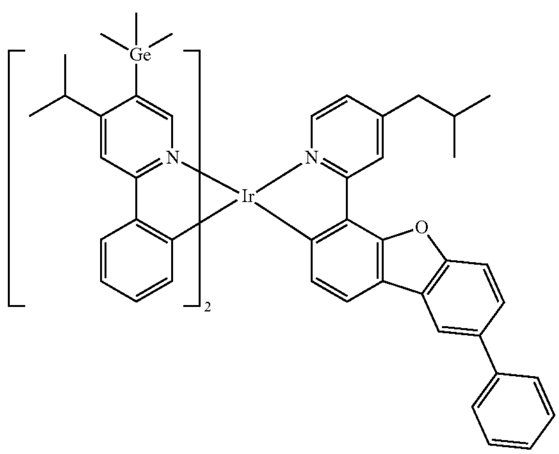
1166
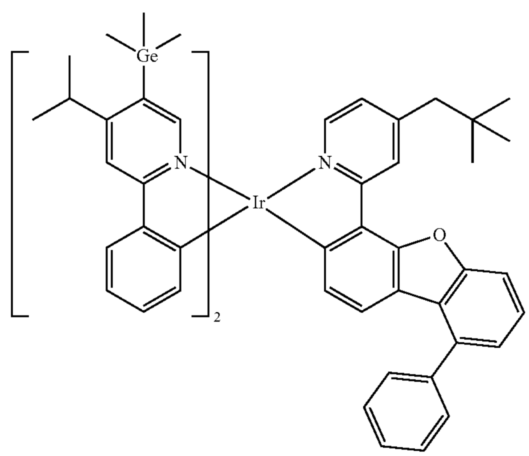
1167
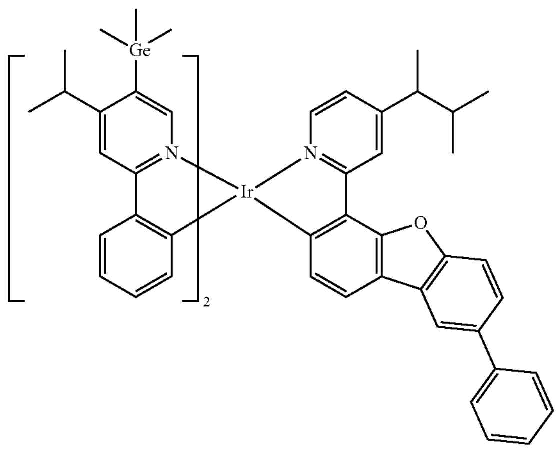
1168
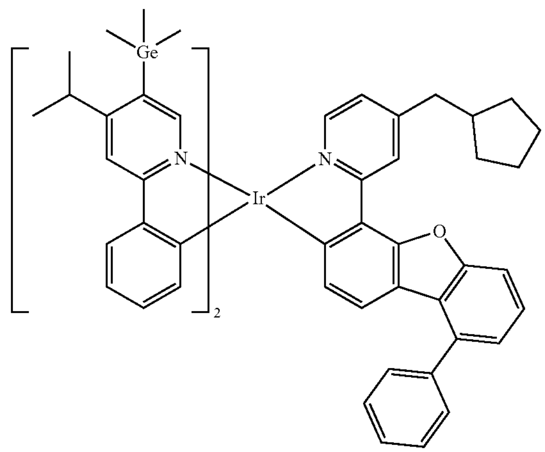

-continued
1169
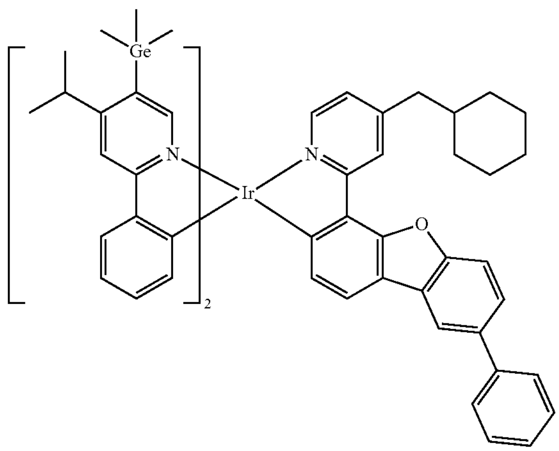
1170
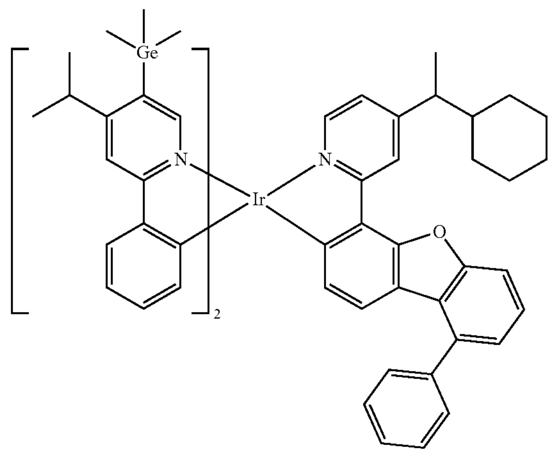
1171
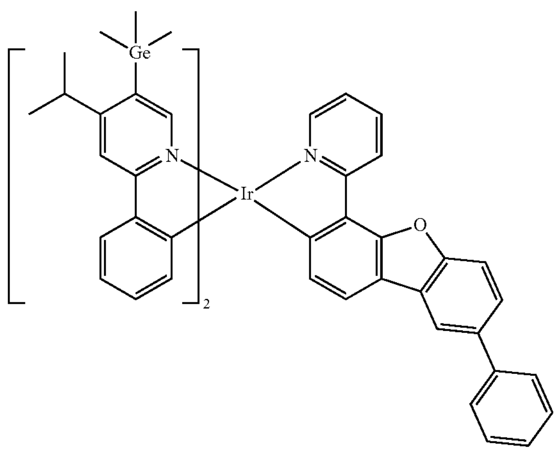
1172
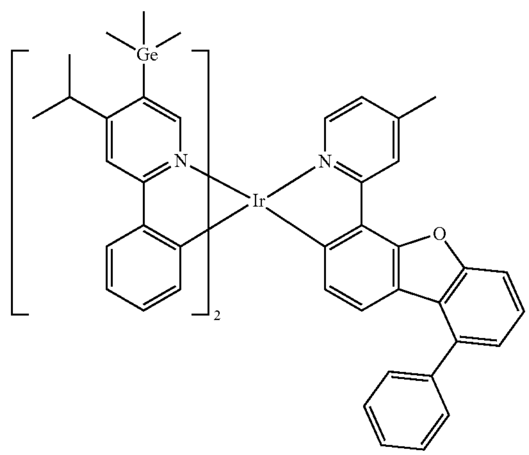
1173
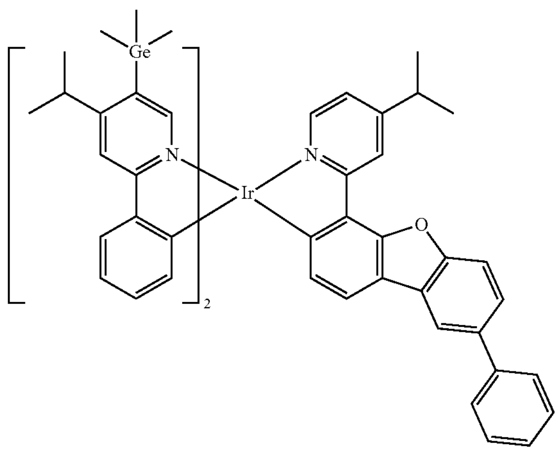
1174
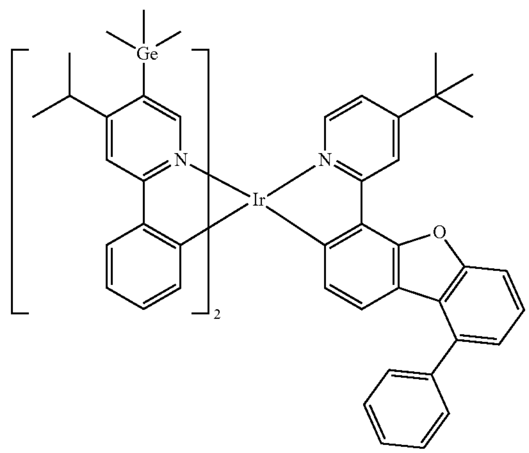

-continued
1175
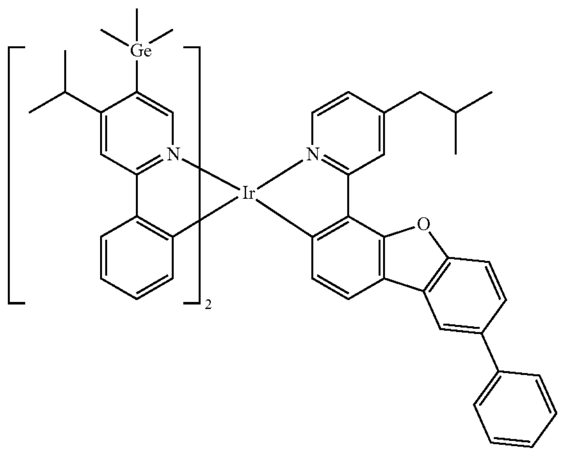
1176
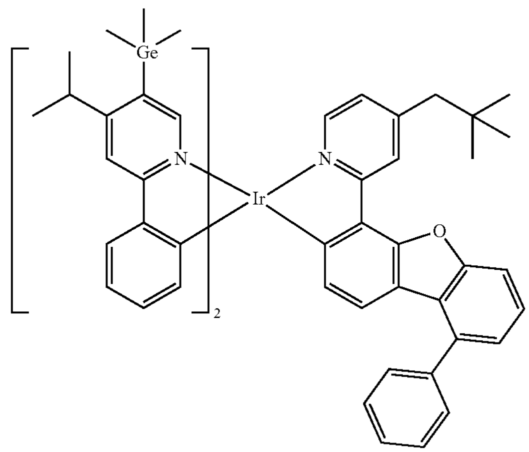
1177
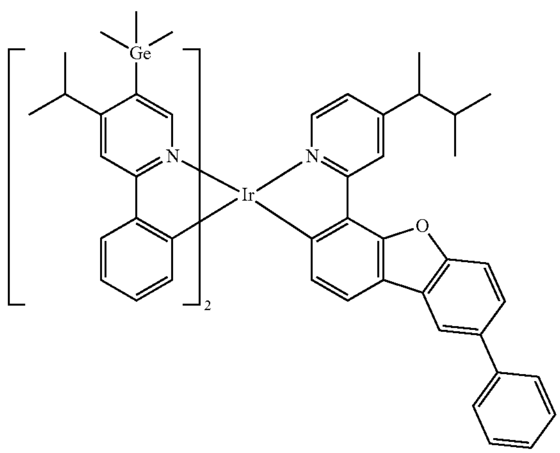
1178
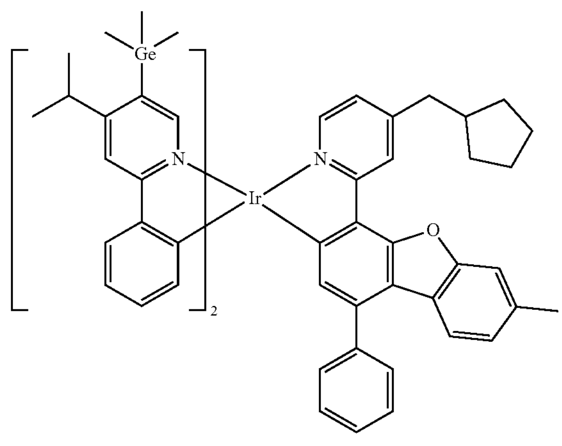
1179
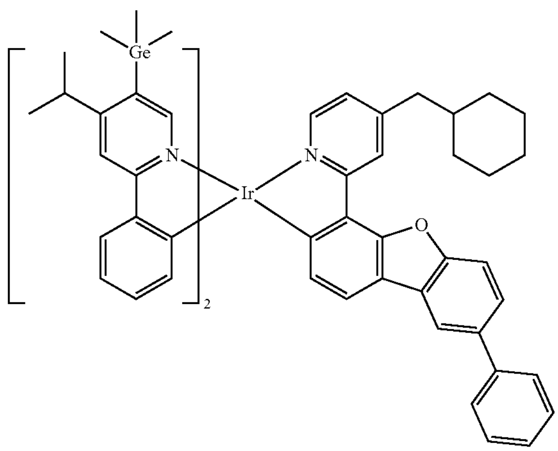
1180
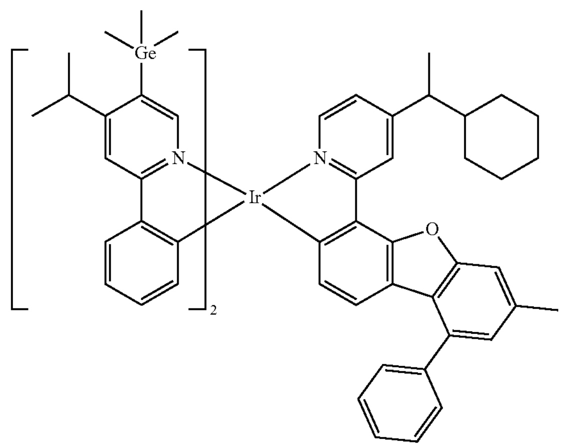

-continued
1181
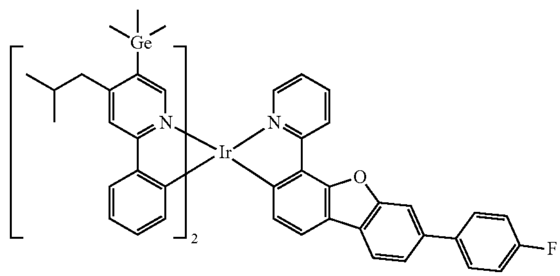
1182
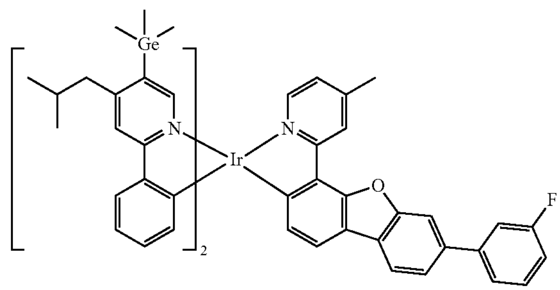
1183
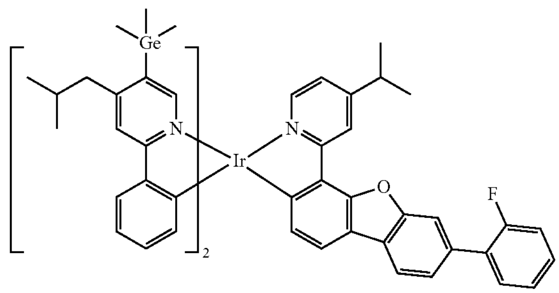
1184
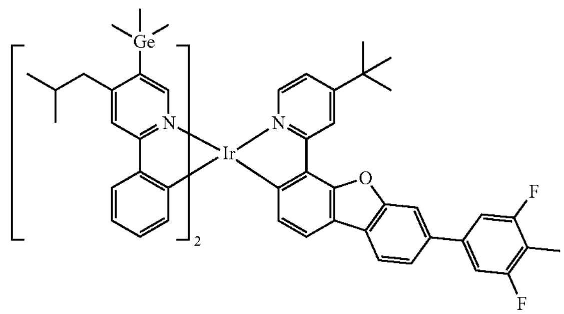
1185
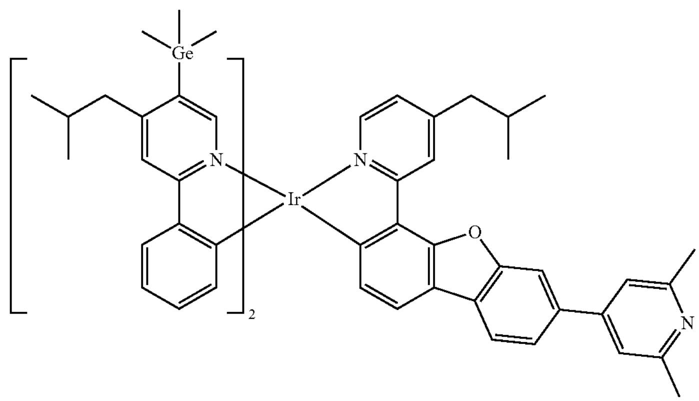
1186
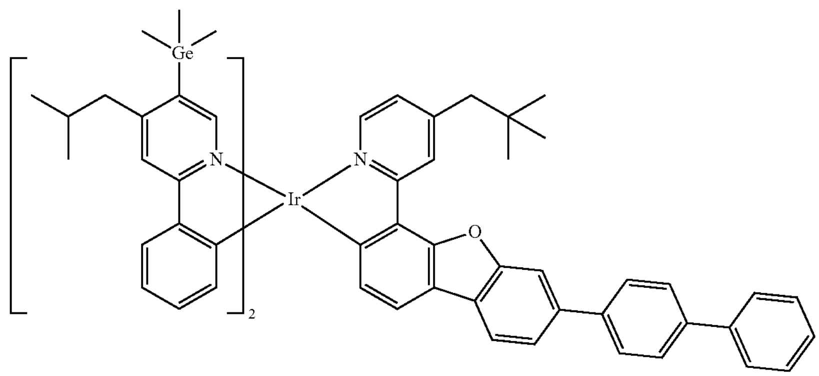

-continued
1187
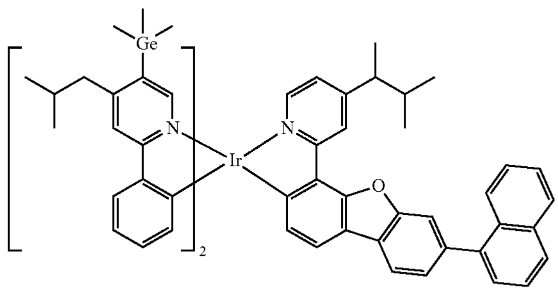
1188
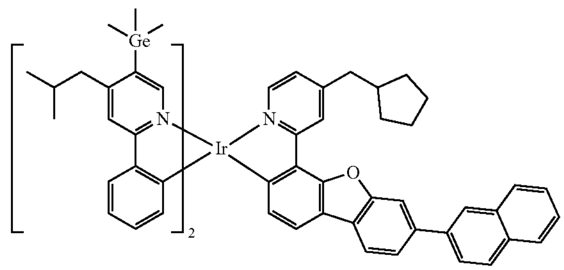
1189
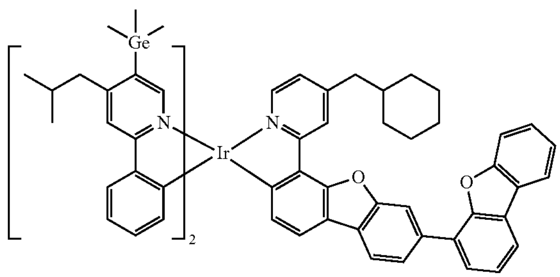
1190
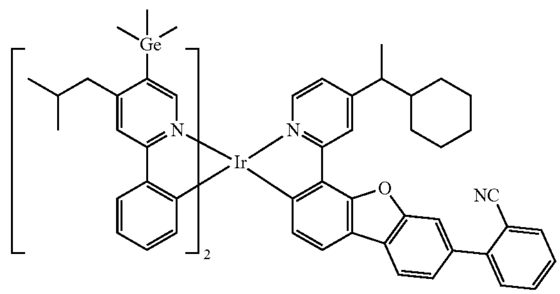
1191
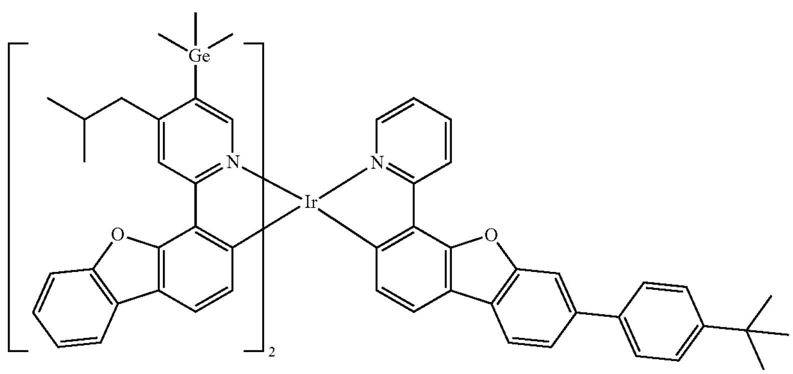
1192
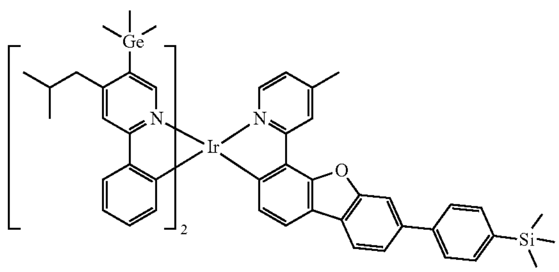
1193
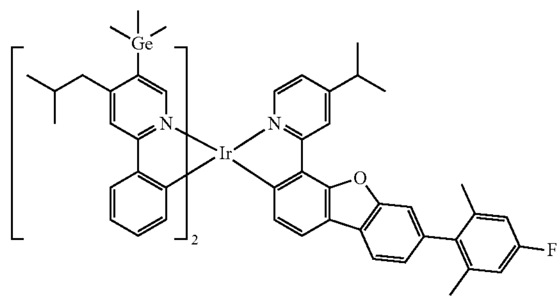

-continued
1194
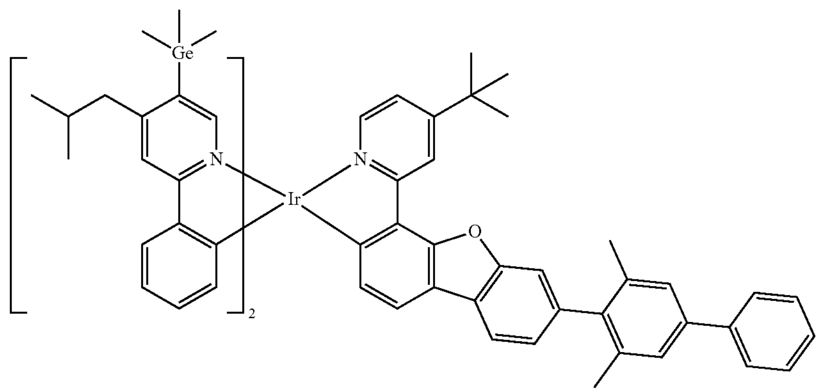
1195
1196
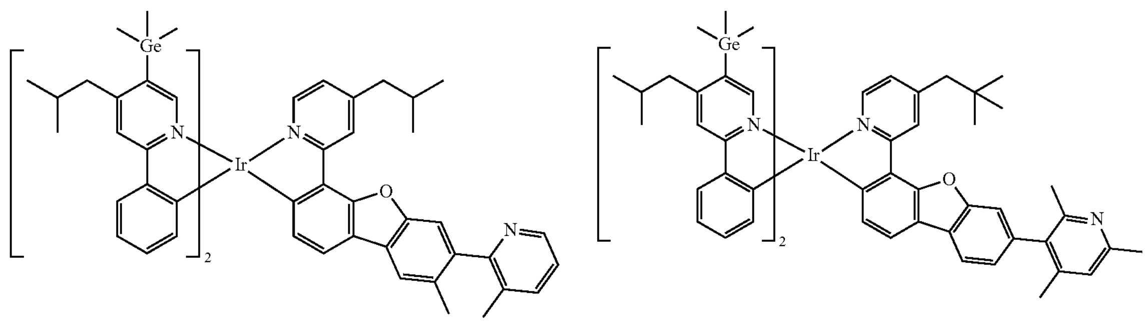
1197
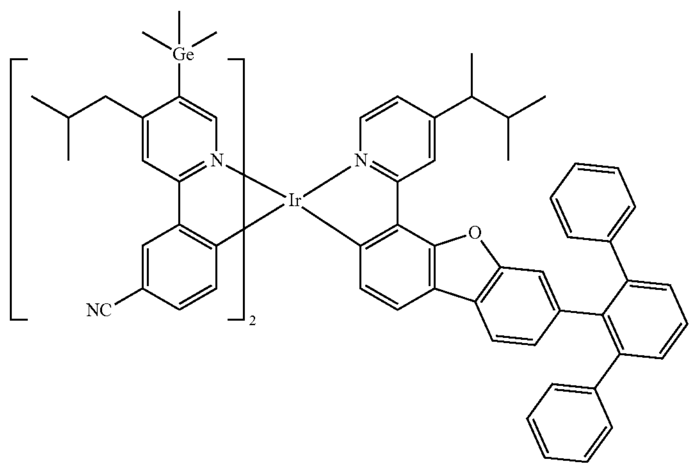
1198
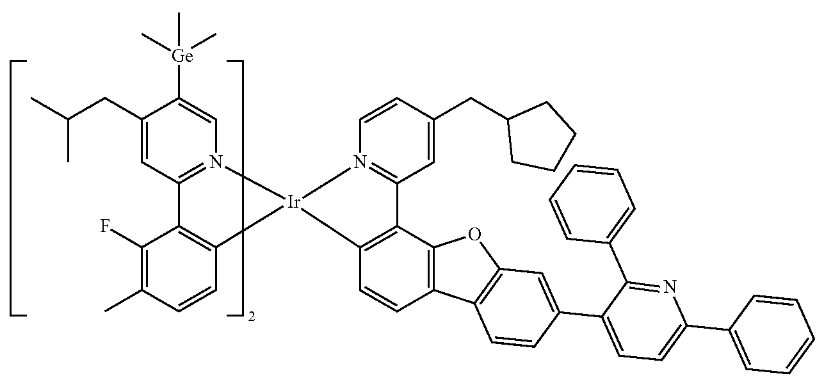

-continued
1199
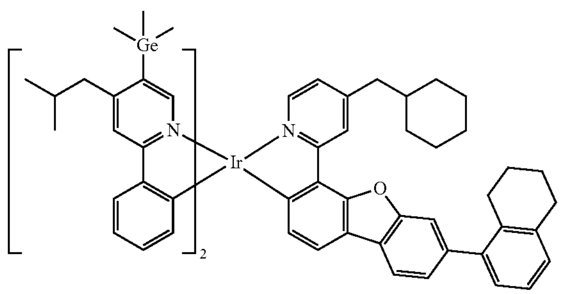
1200
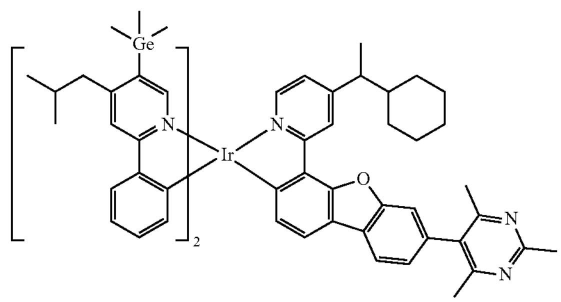
1201
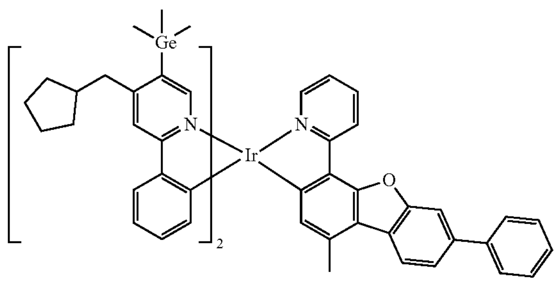
1202
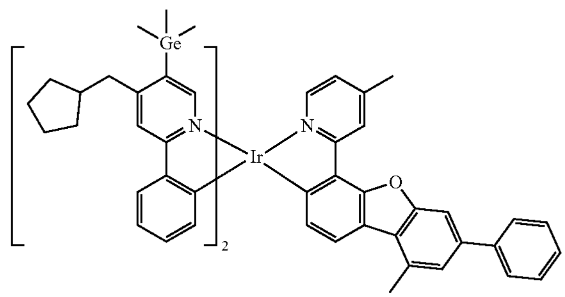
1203
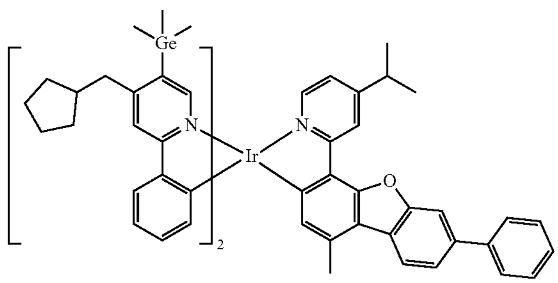
1204
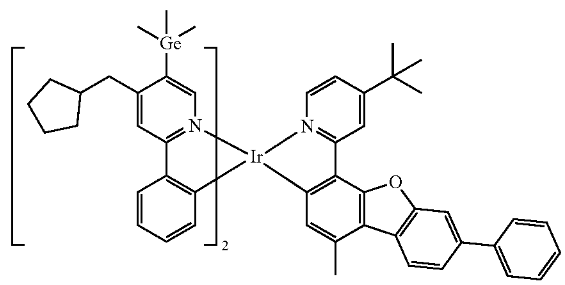
1205
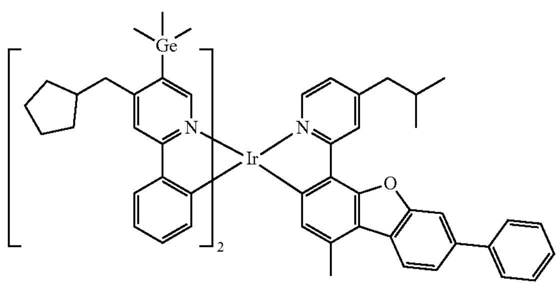
1206
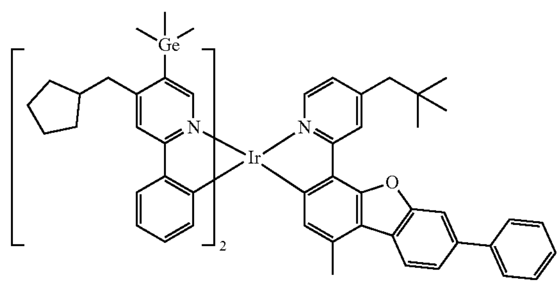
1207
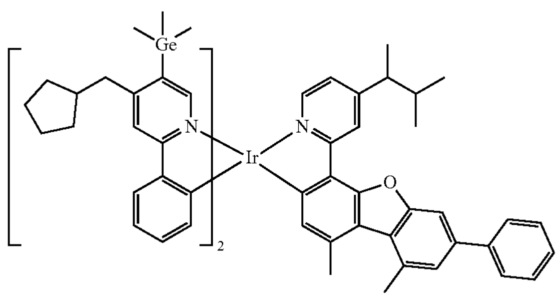
1208
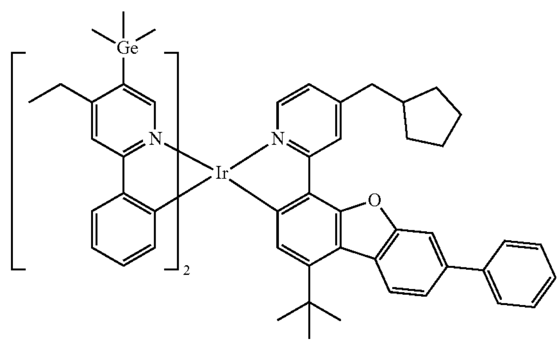

-continued
1209
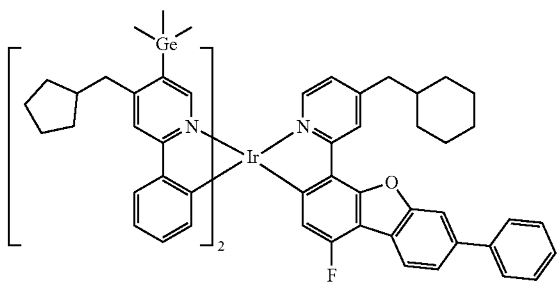
1210
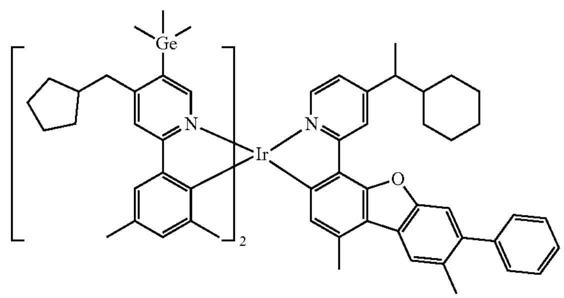
1211
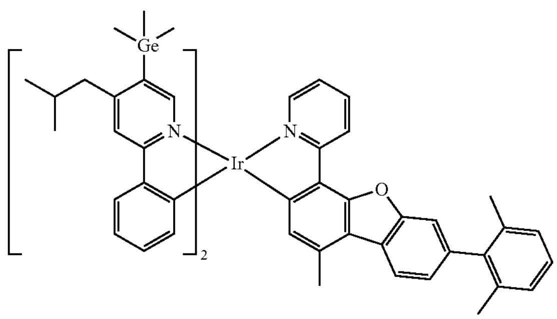
1212
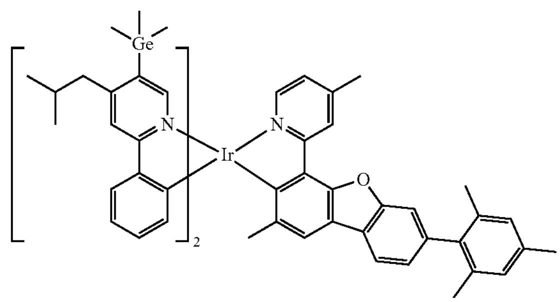
1213
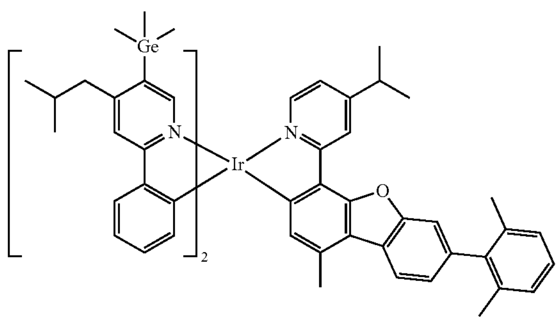
1214
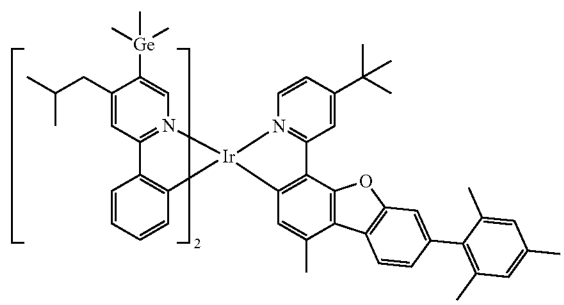
1215
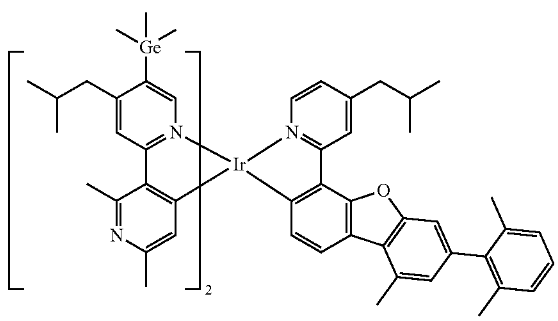
1216
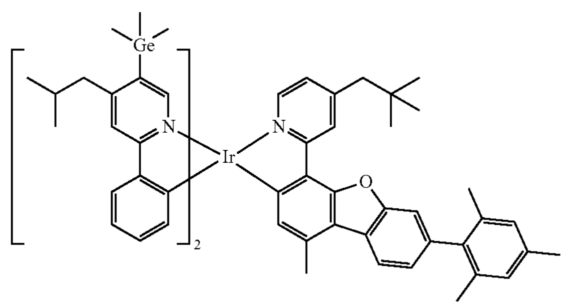

-continued
1217
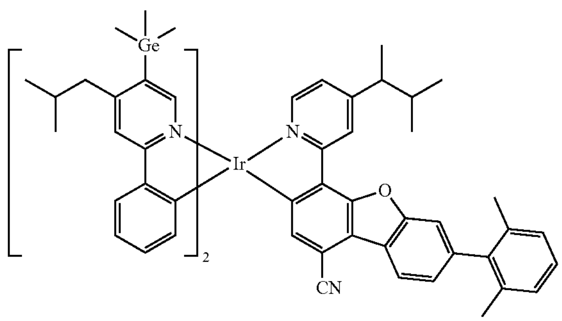
1218
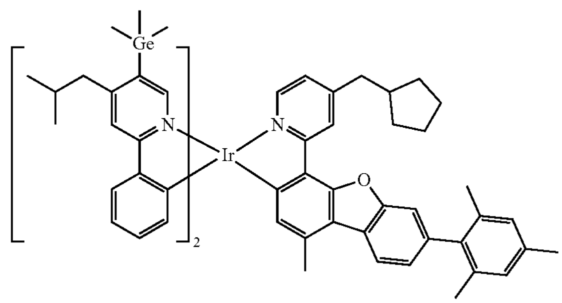
1219
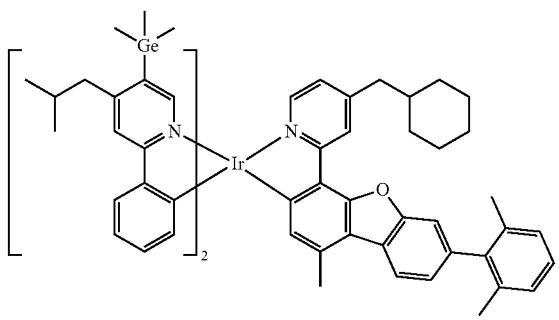
1220
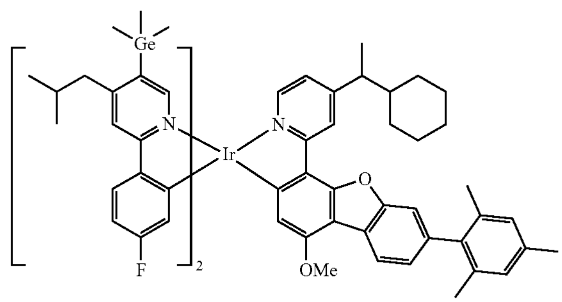
1221
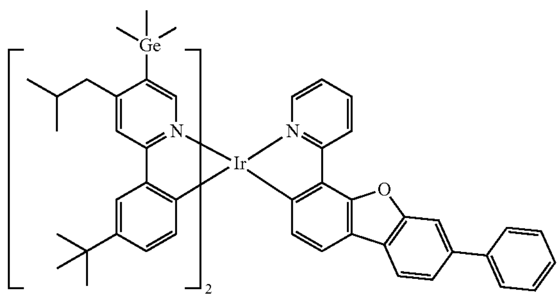
1222
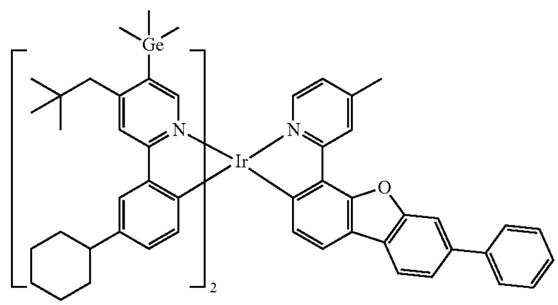
1223
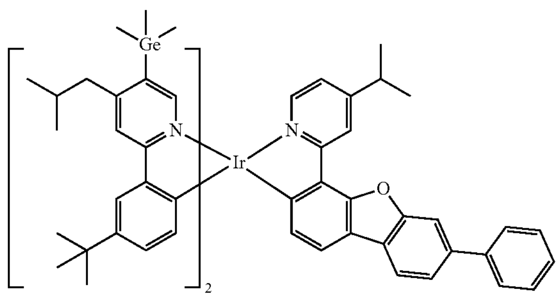
1224
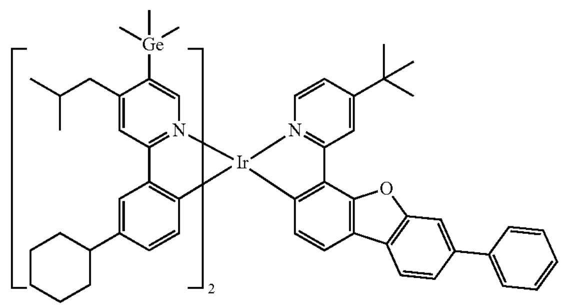

-continued
1225
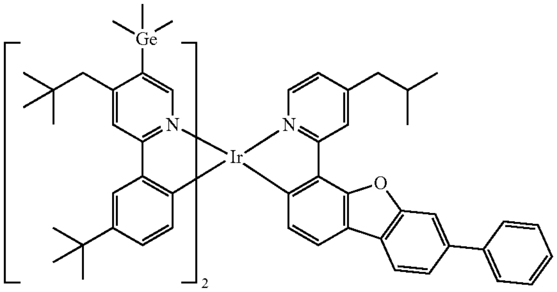
1226
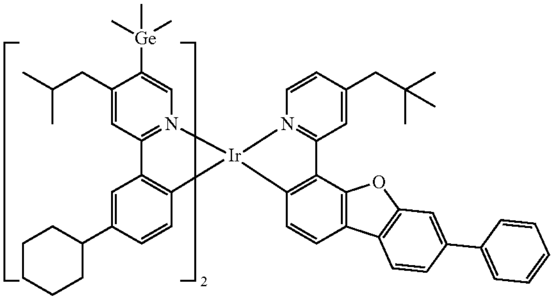
1227
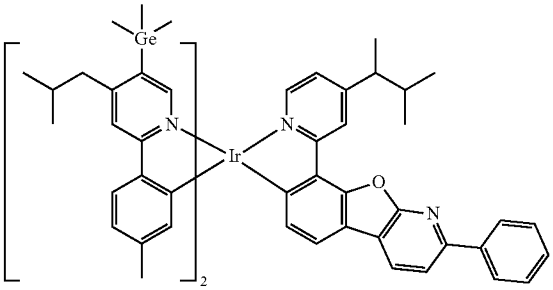
1228
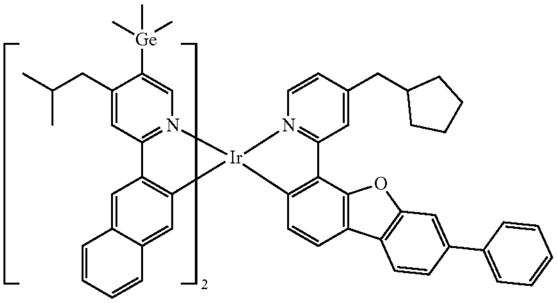
1229
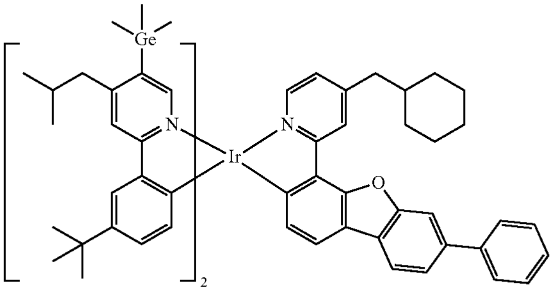
1230
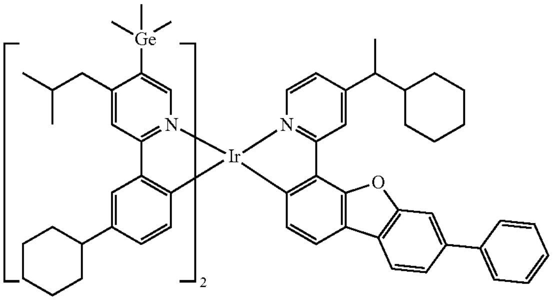
1231
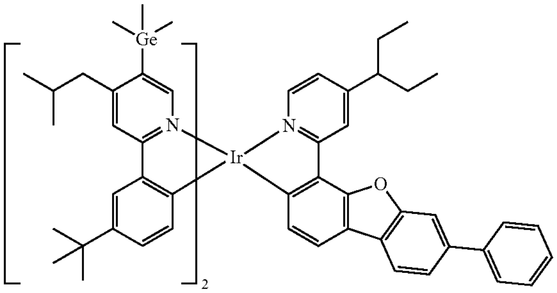
1232
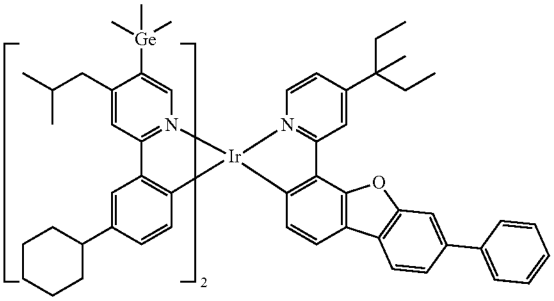
1233
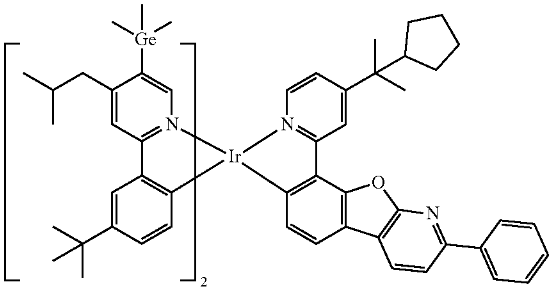
1234
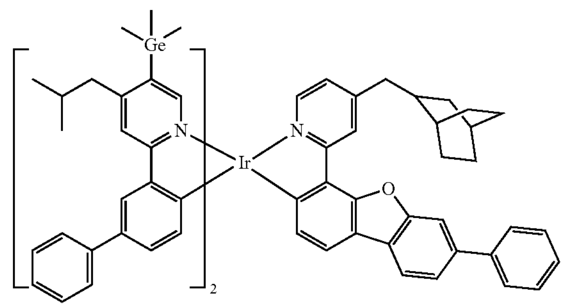

-continued
1235
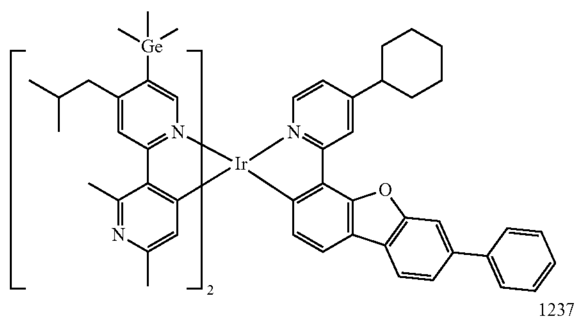
1236
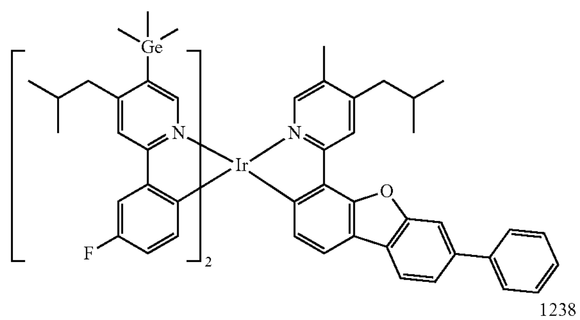
1237
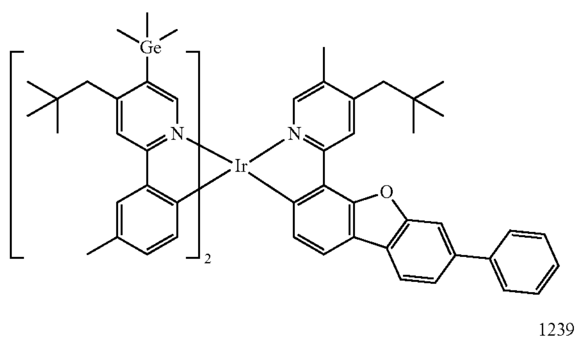
1238
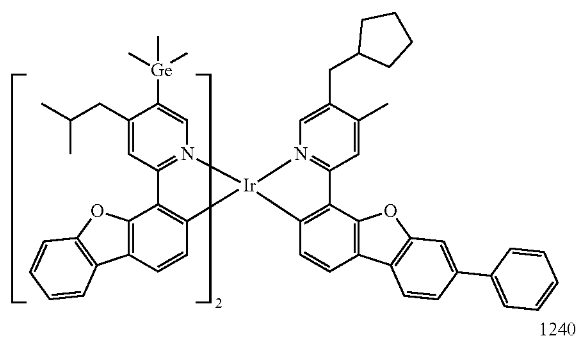
1239
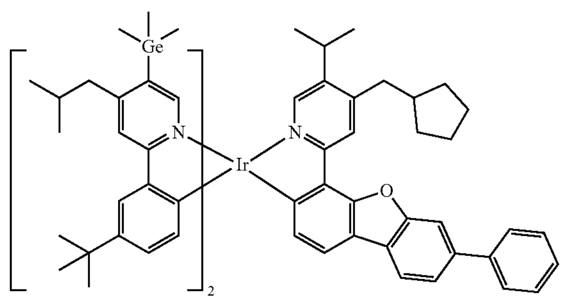
1240
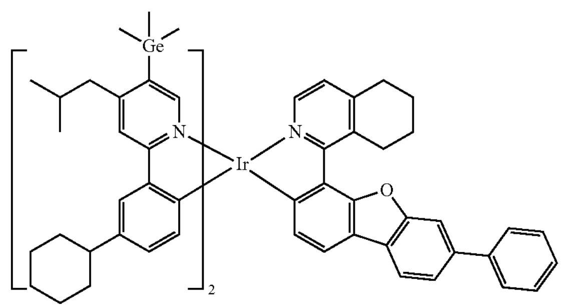
1241
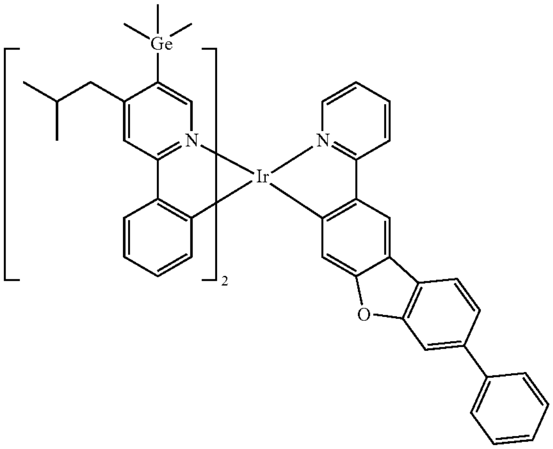
1242
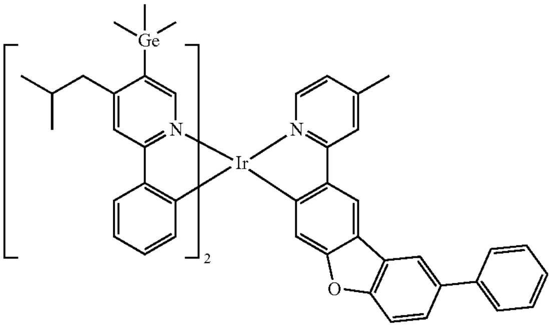

-continued
1243
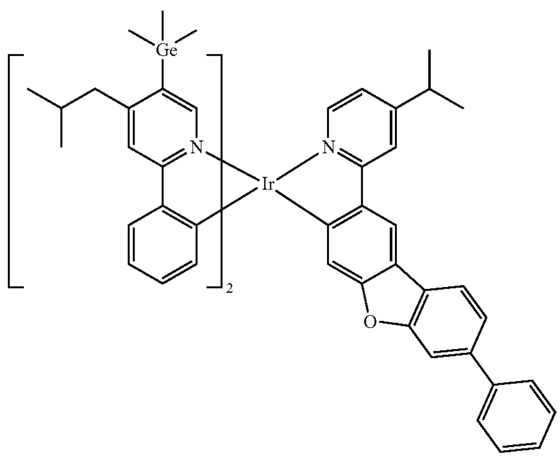
1244
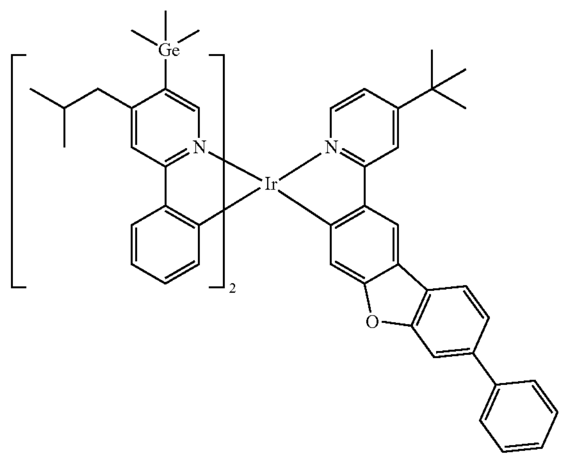
1245
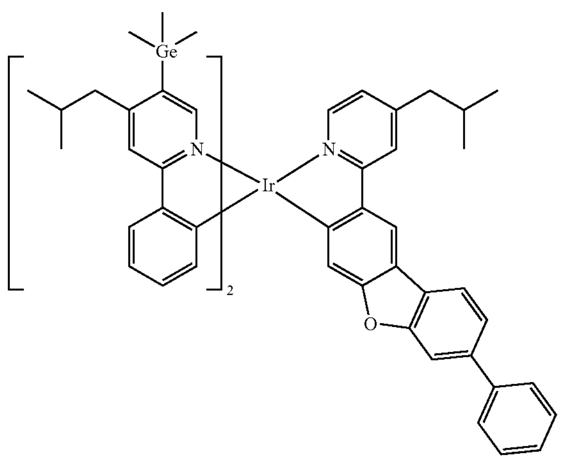
1246
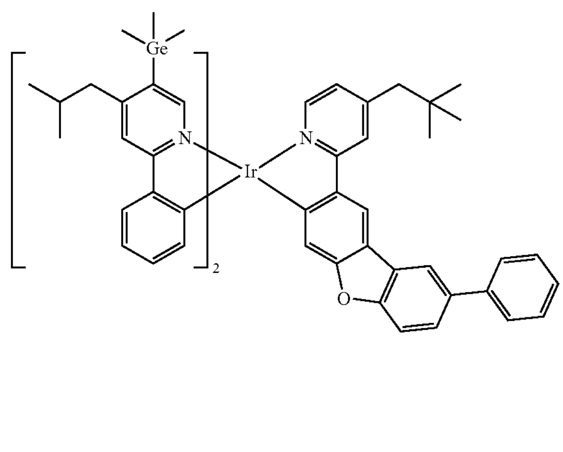
1247
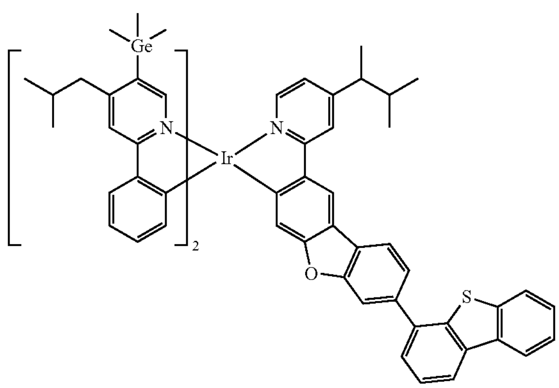
1248
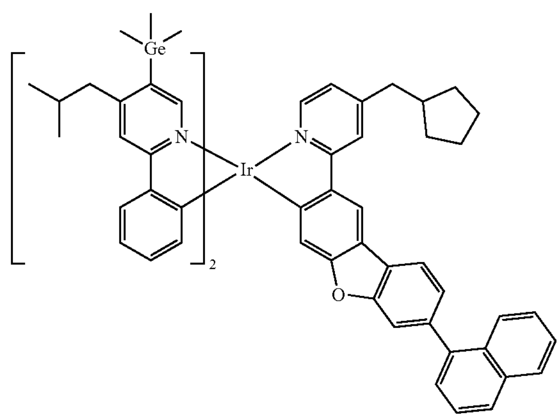

-continued
1249
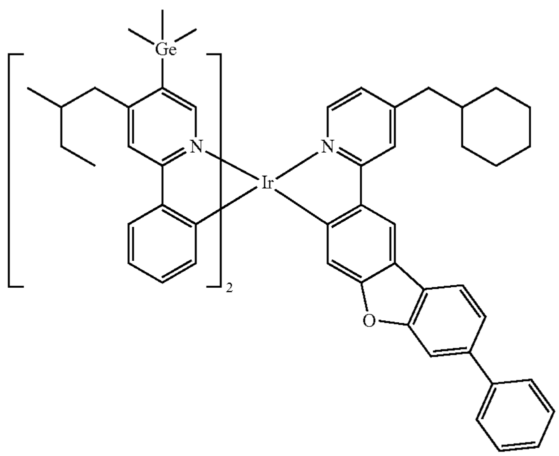
1250
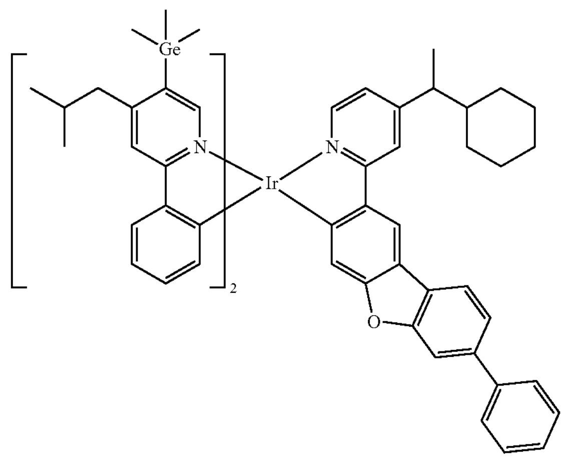
1251
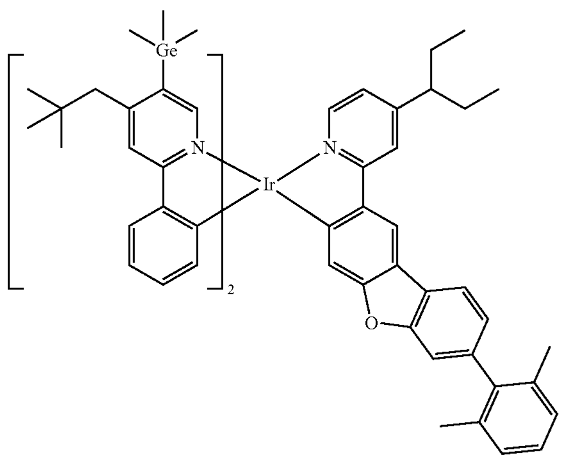
1252
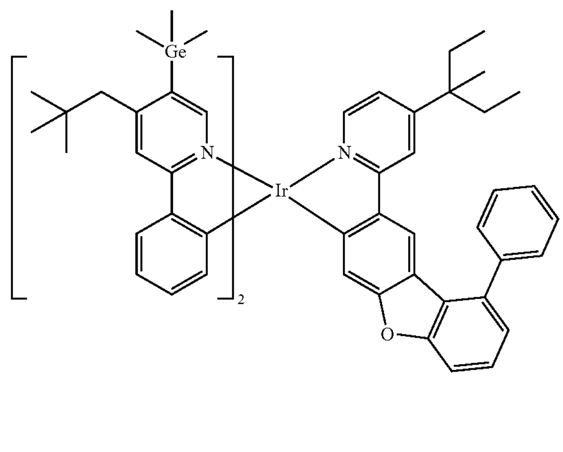
1253
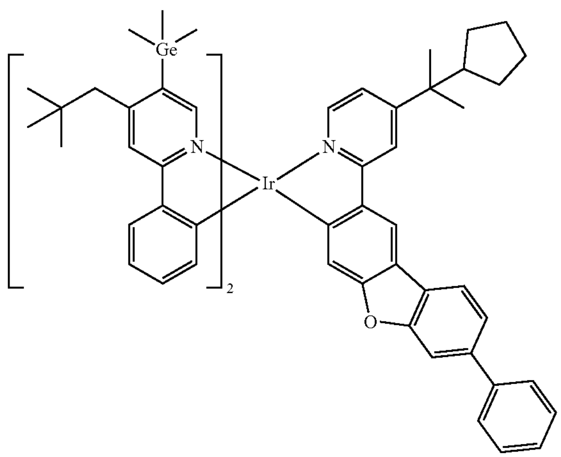
1254
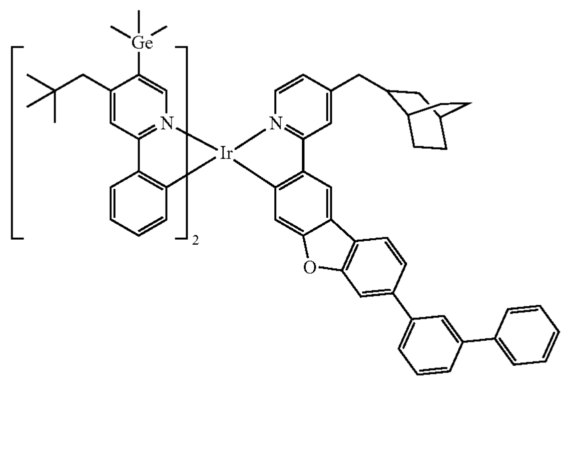

-continued
1255
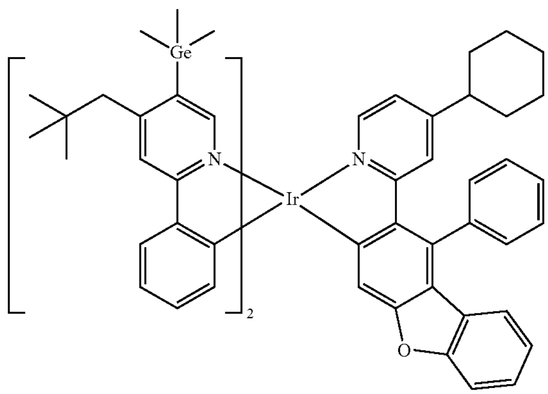
1256
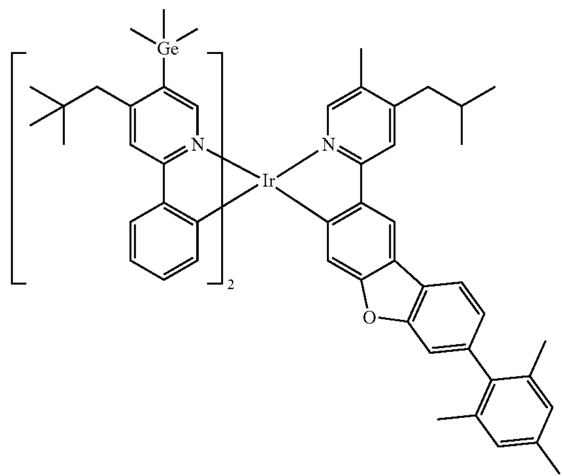
1257
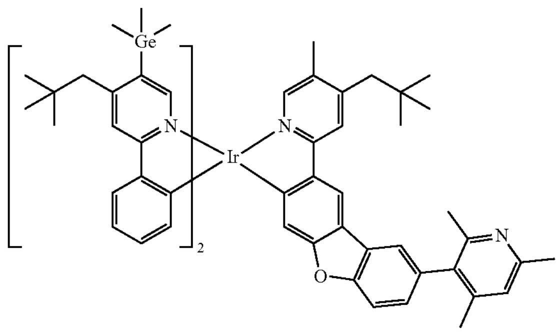
1258
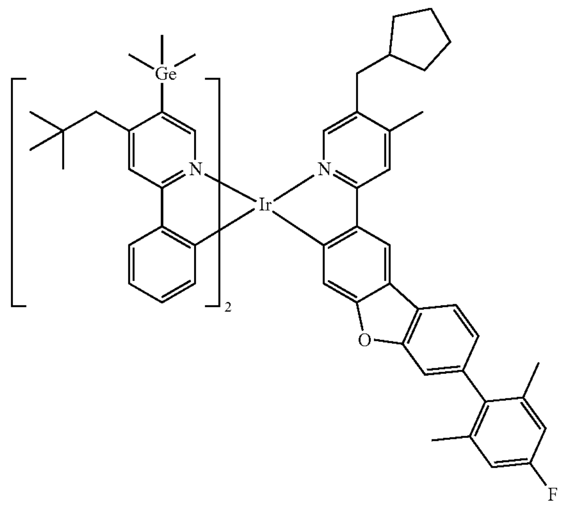
1259
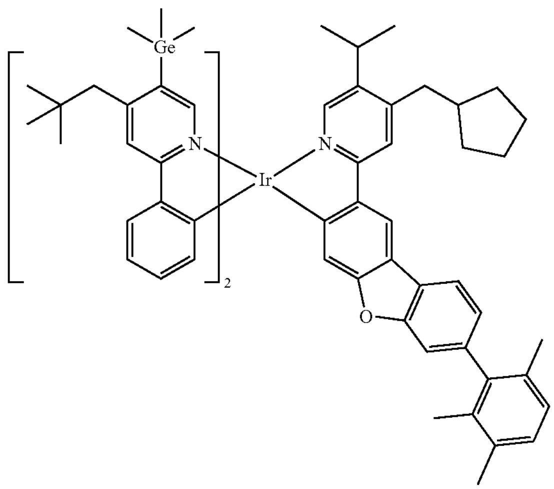
1260
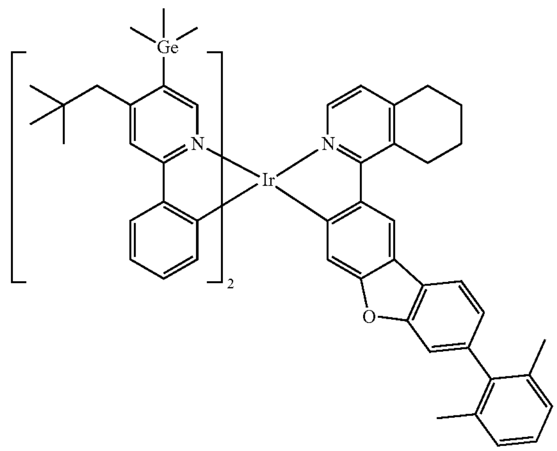

-continued
1261
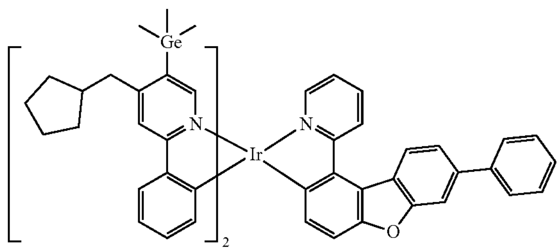
1262
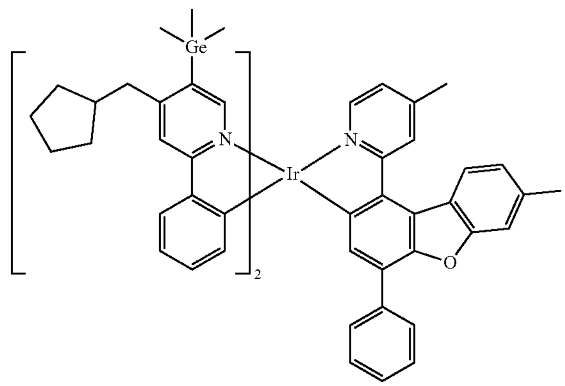
1263
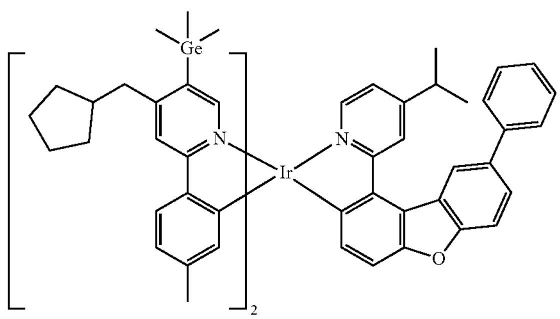
1264
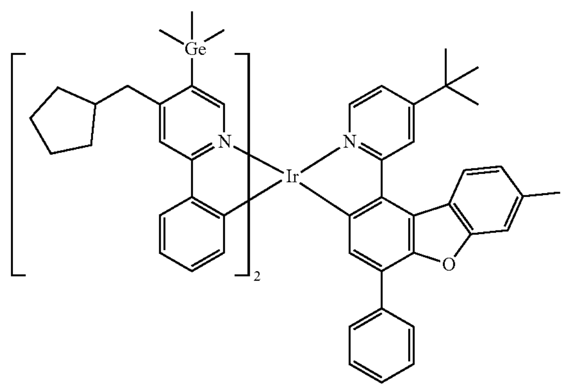
1265
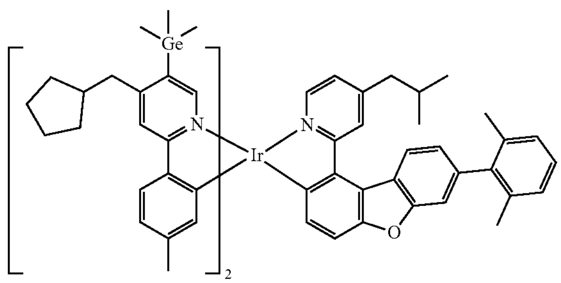
1266
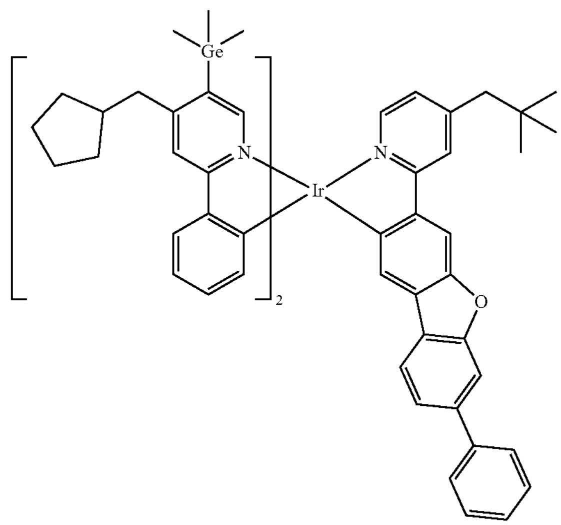

-continued
1267
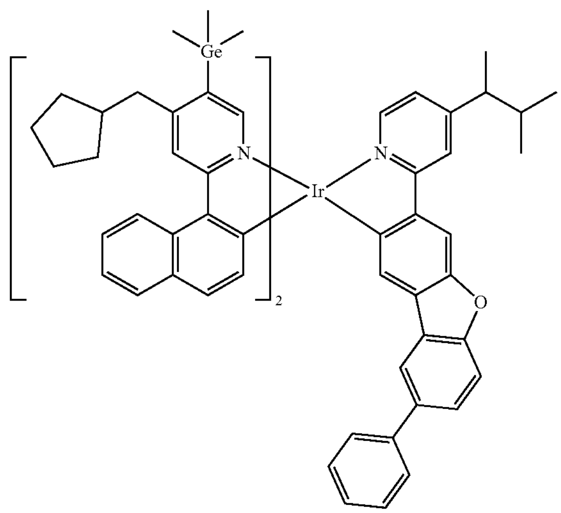
1268
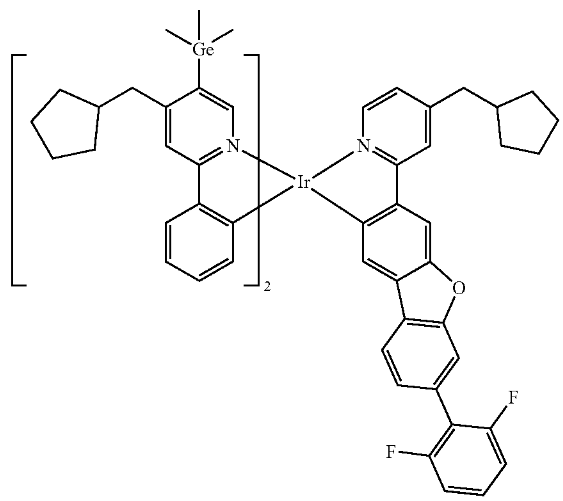
1269
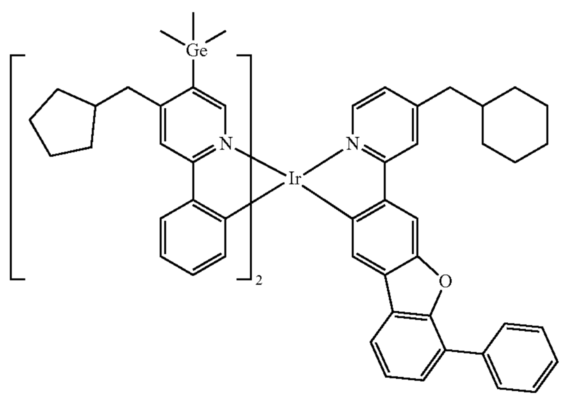
1270
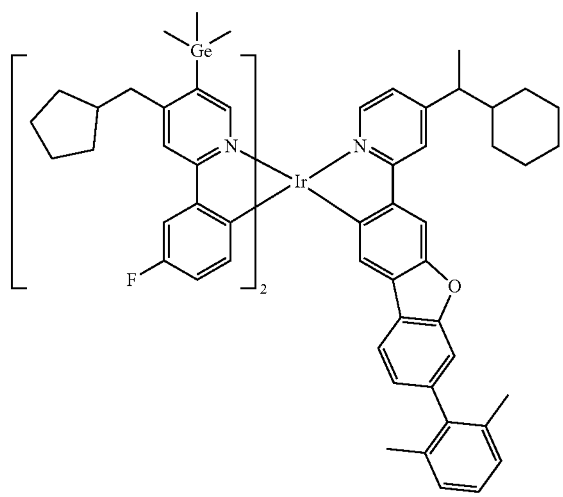
1271
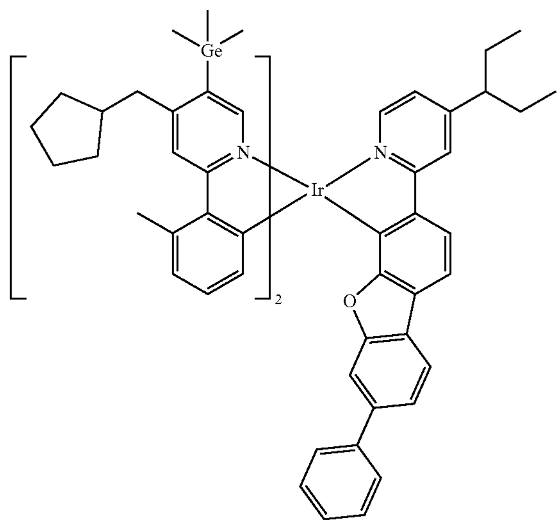
1272
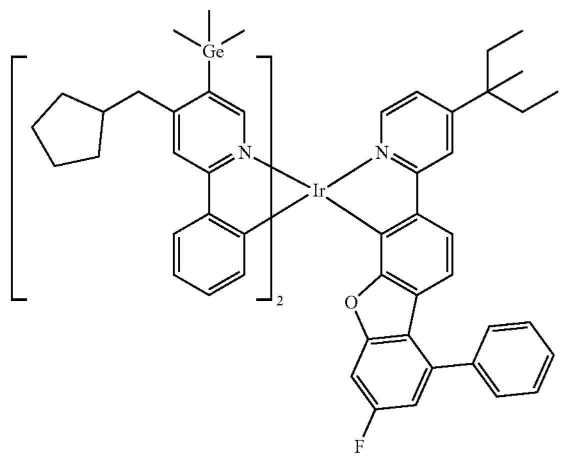

-continued
1273
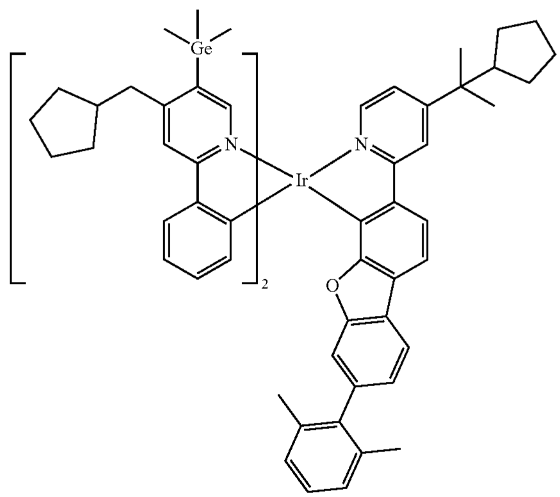
1274
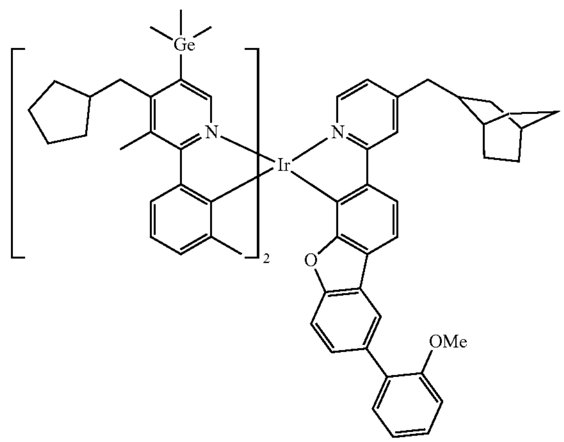
1275
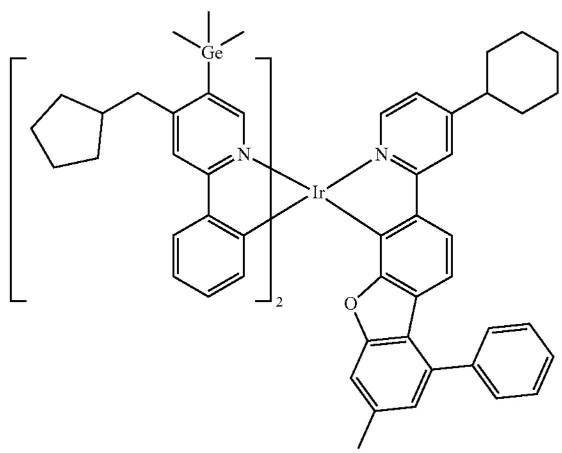
1276
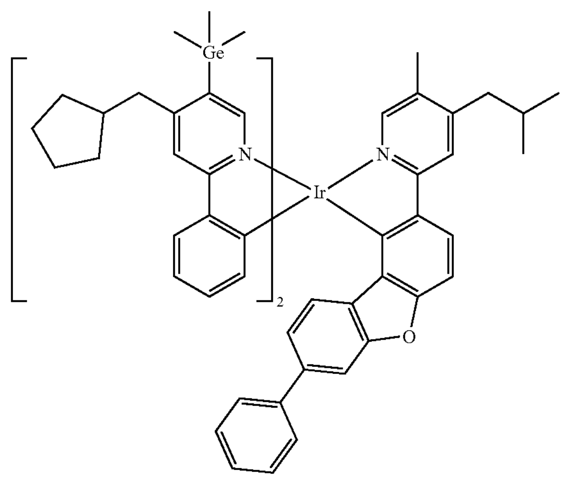
1277
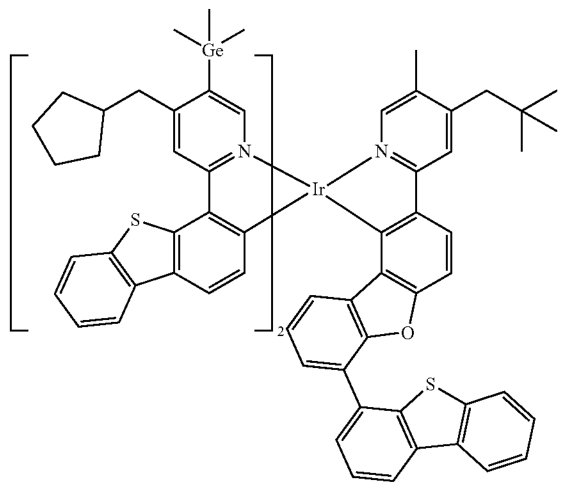
1278
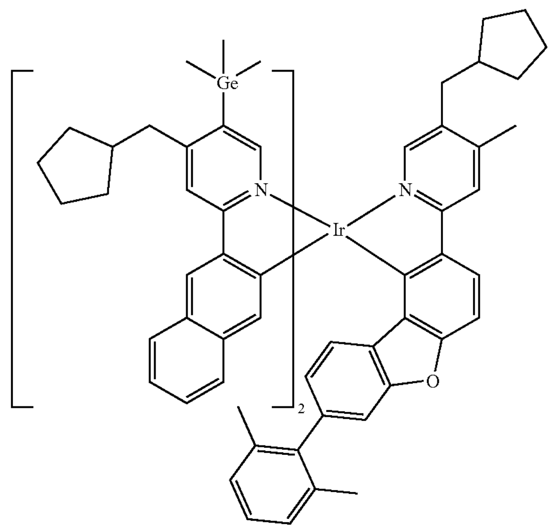

-continued
1279
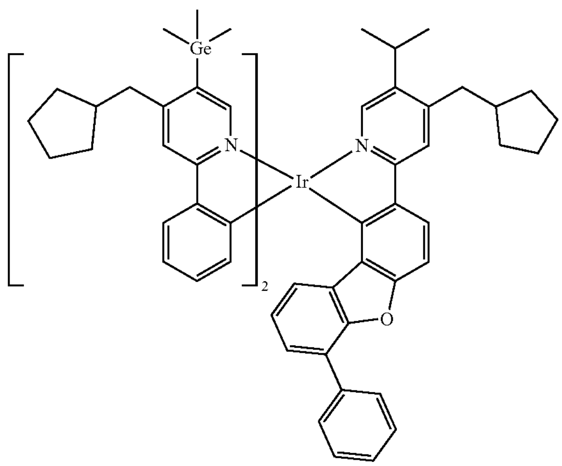
1280
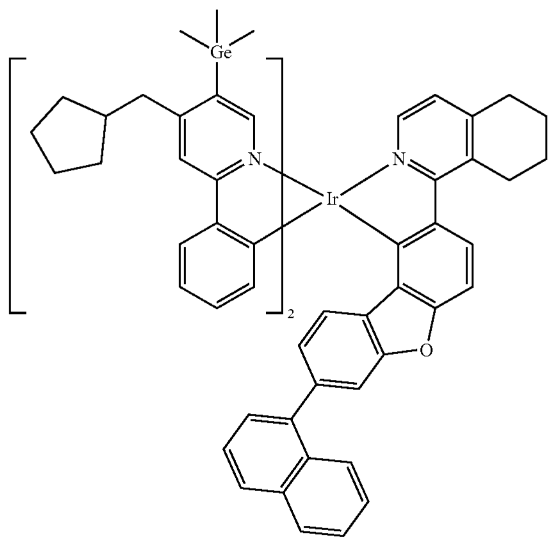
1281
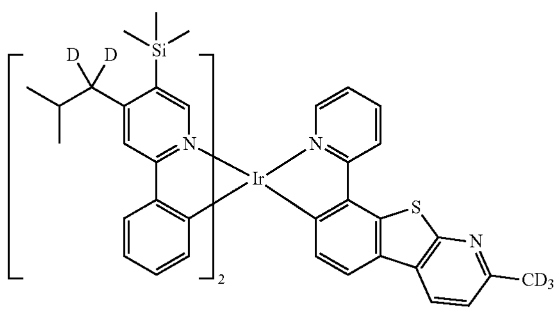
1282
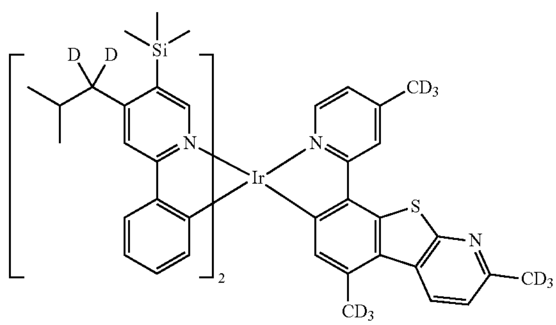
1283
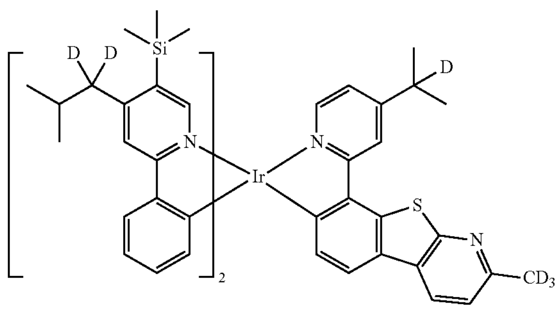
1284
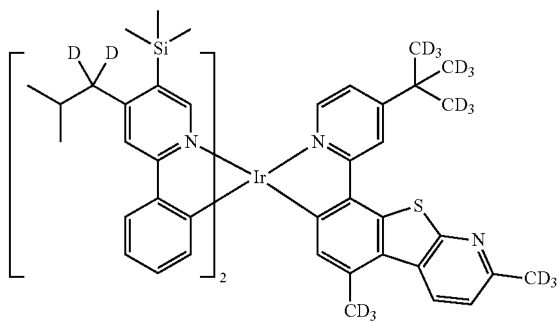
1285
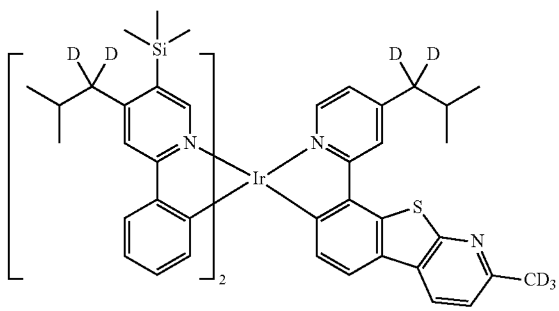
1286
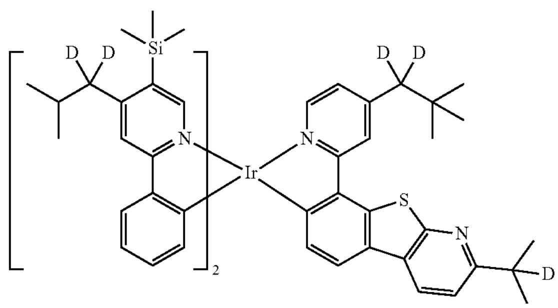

-continued
1287
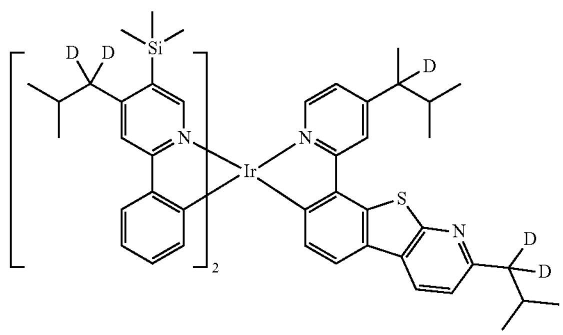
1288
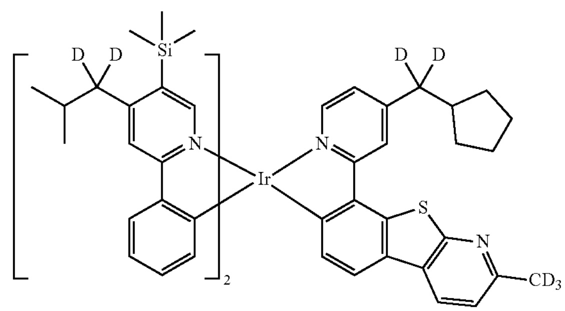
1289
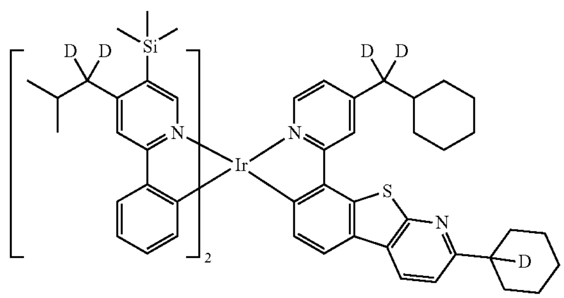
1290
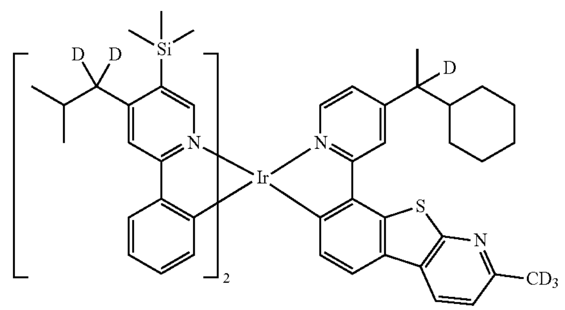
1291
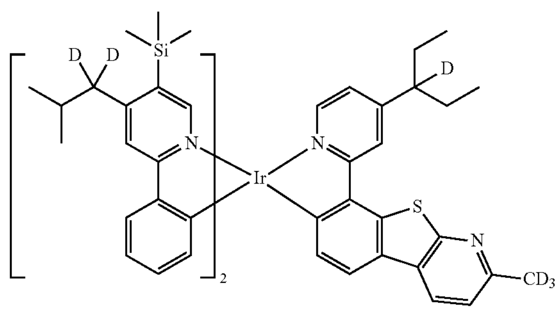
1292
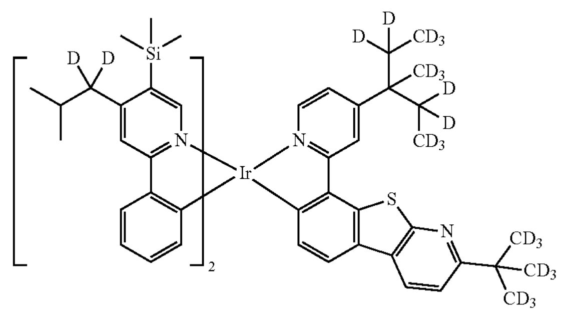
1293
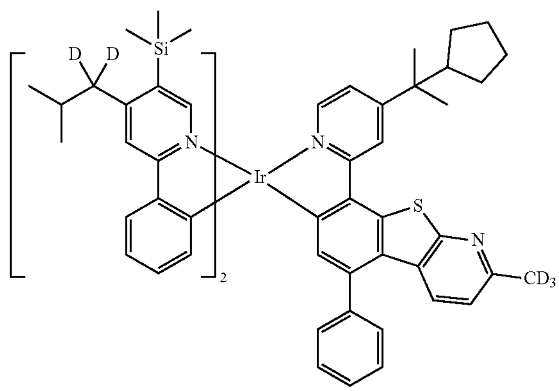
1294
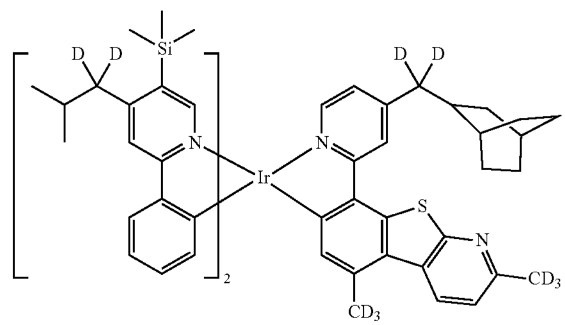

-continued
1295
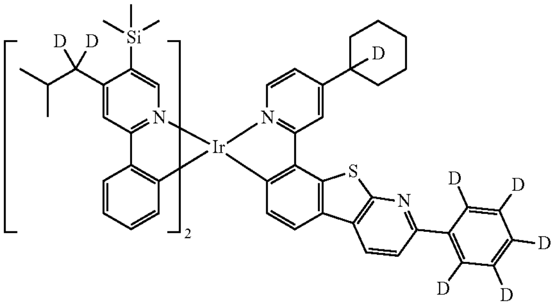
1296
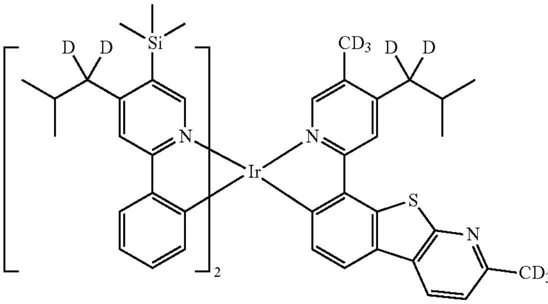
1297
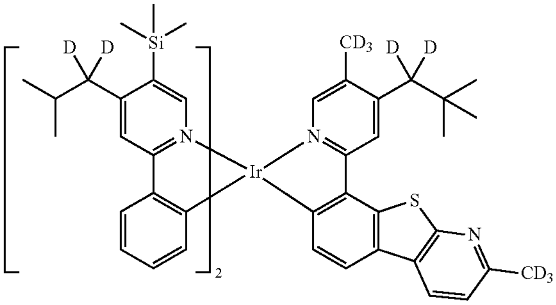
1298
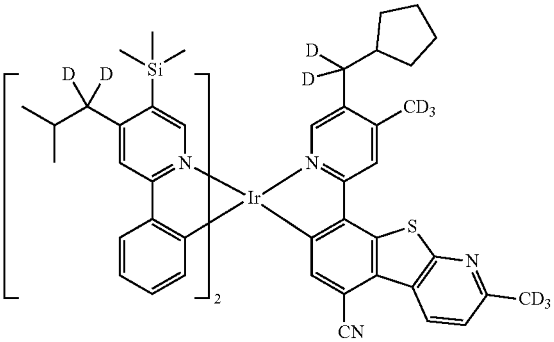
1299
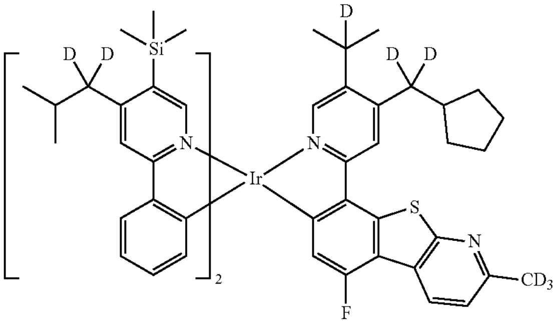
1300
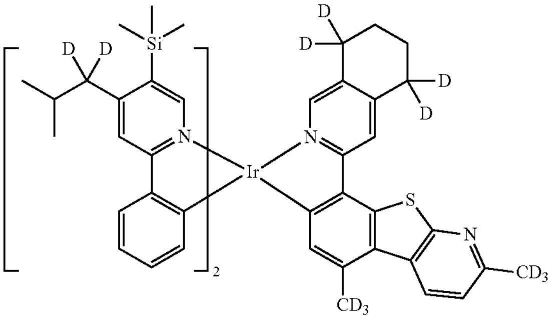
1301
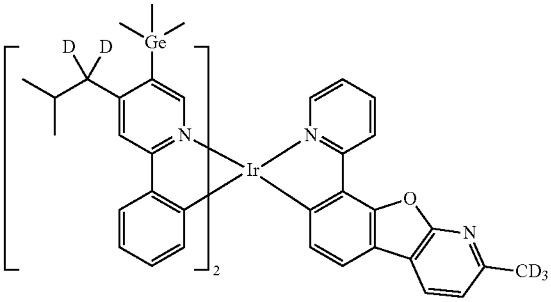
1302
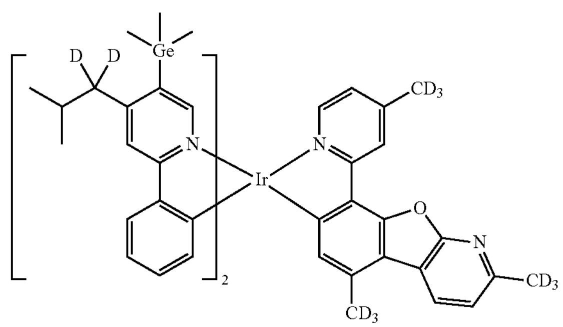

-continued
1303
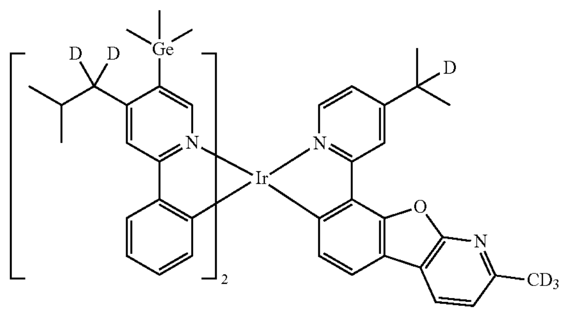
1304
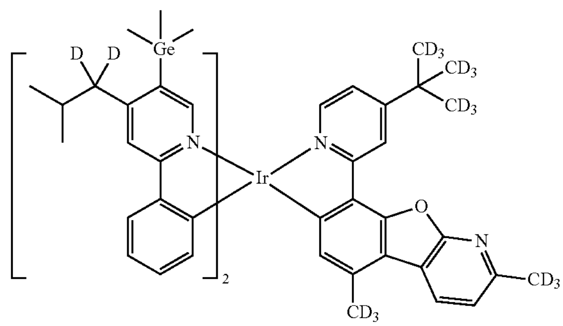
1305
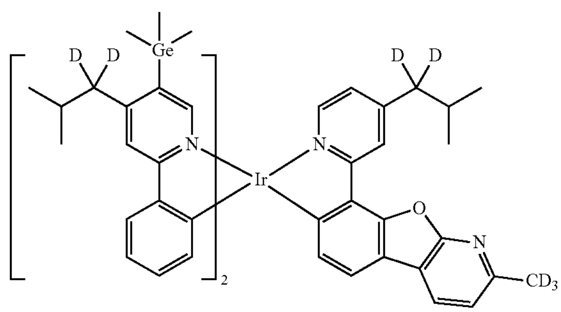
1306
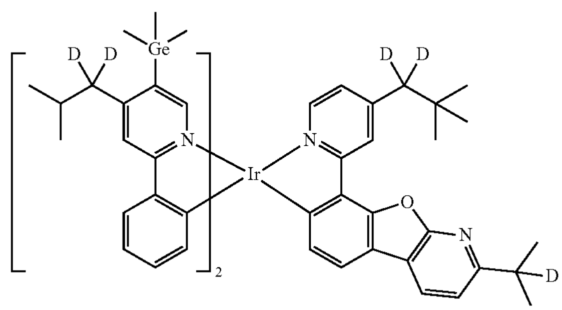
1307
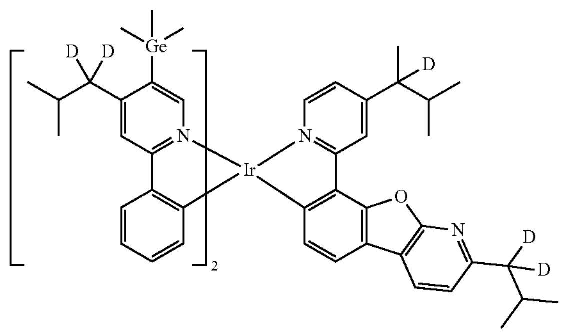
1308
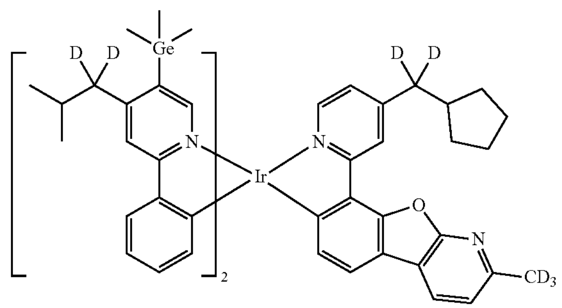
1309
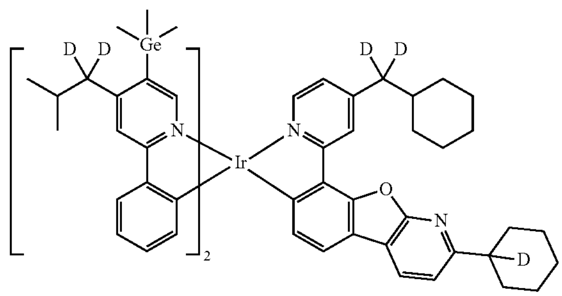
1310
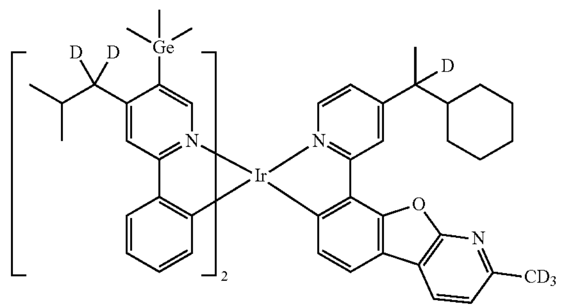

-continued
1311
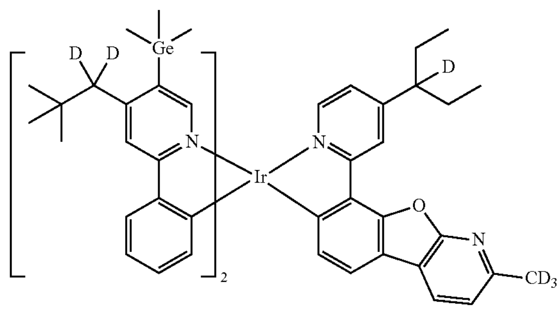
1312
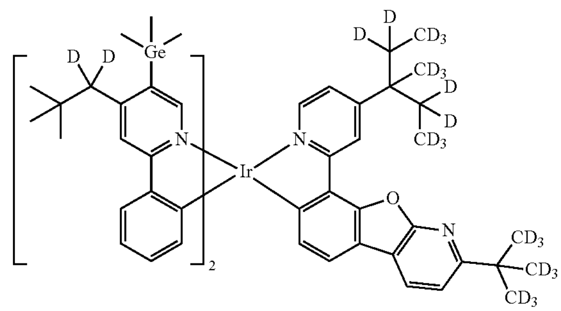
1313
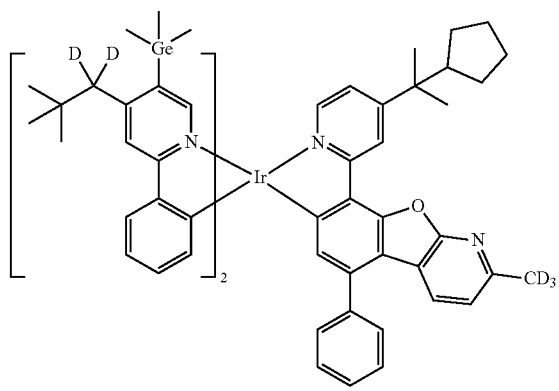
1314
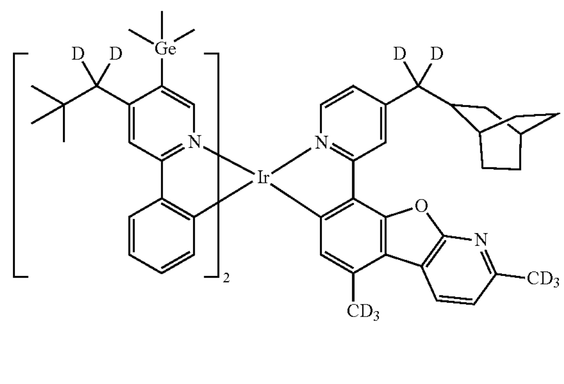
1315
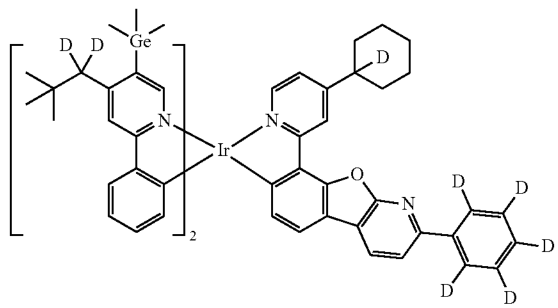
1316
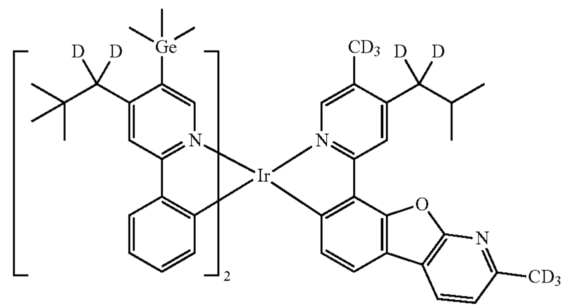
1317
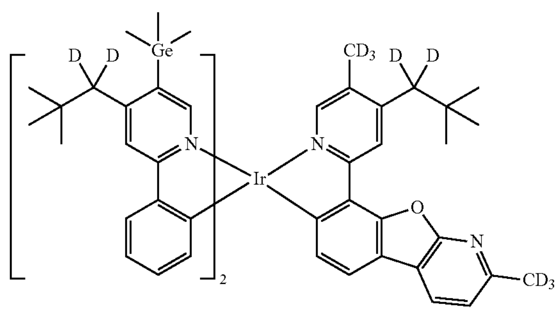
1318
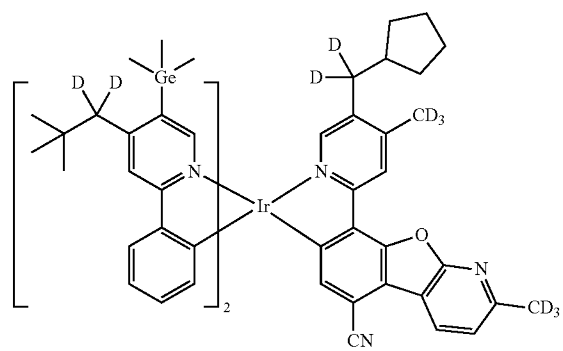

-continued
1319
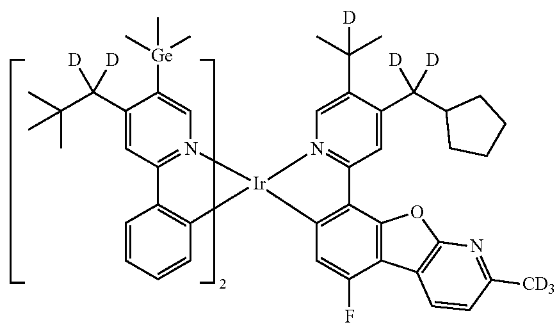
1320
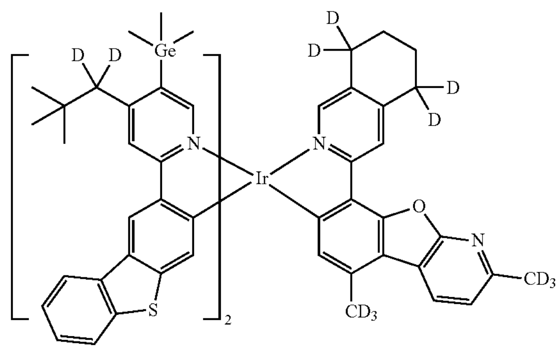
1321
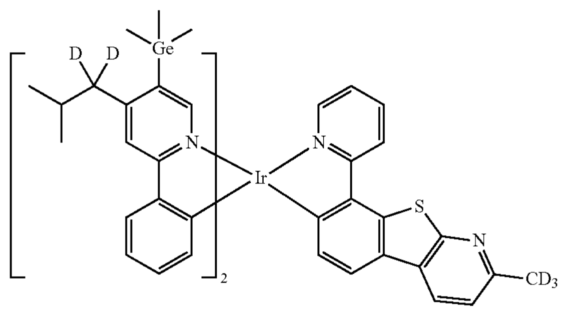
1322
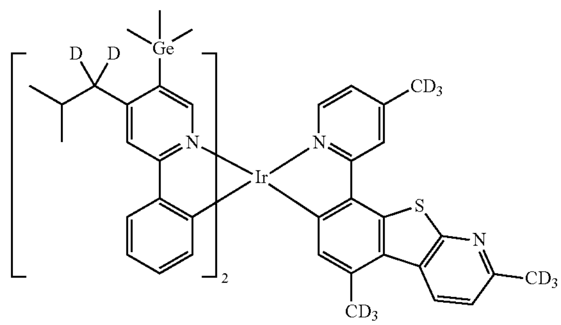
1323
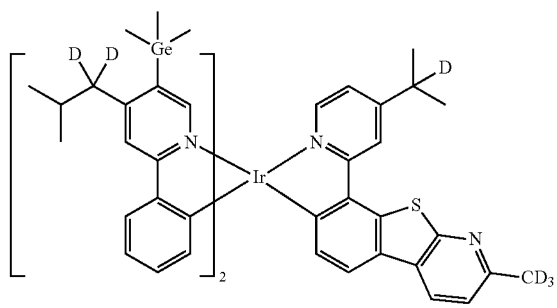
1324
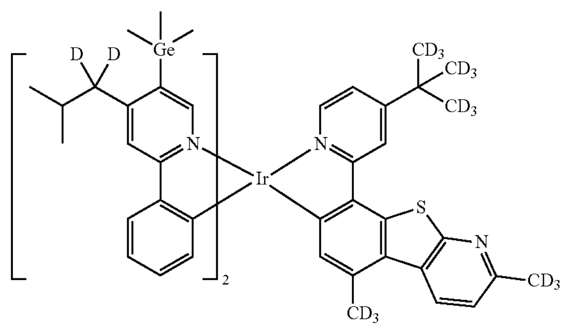
1325
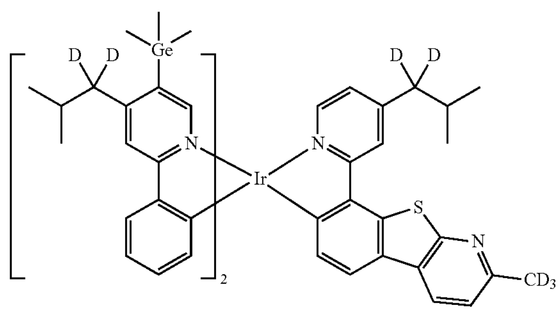
1326
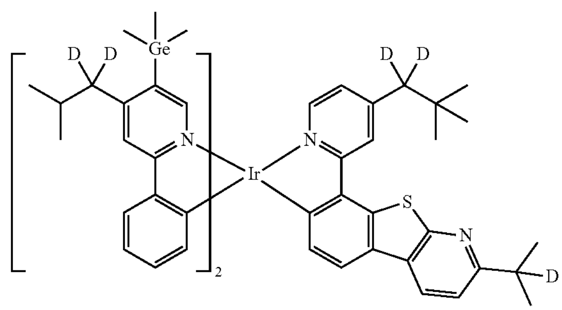

-continued
1327
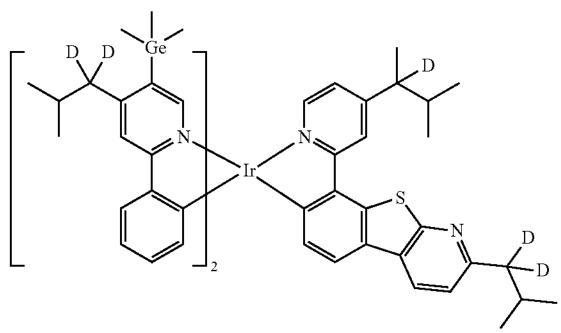
1328
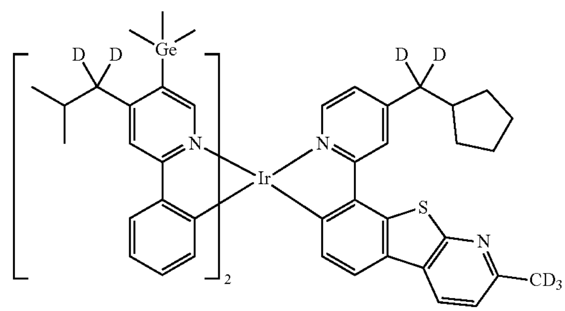
1329
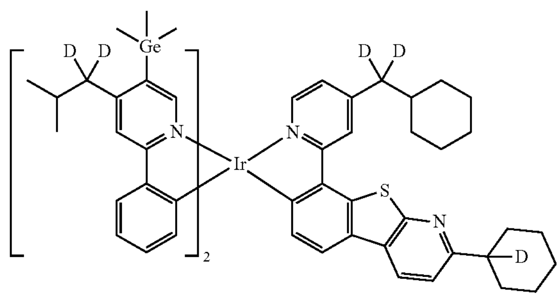
1330
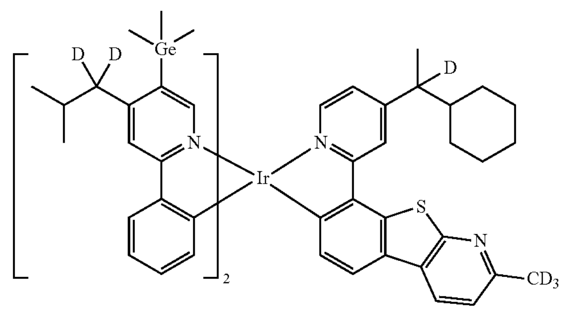
1331
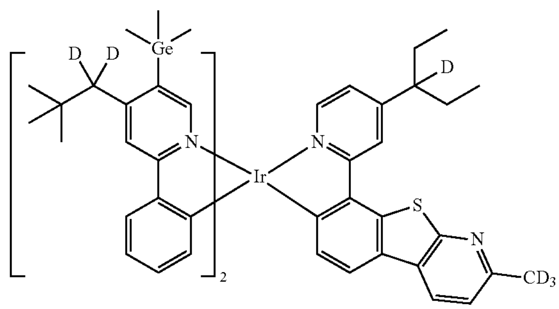
1332
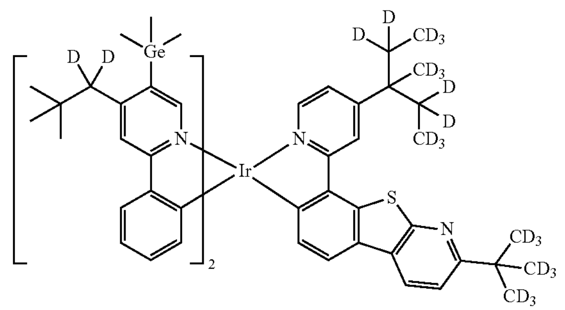
1333
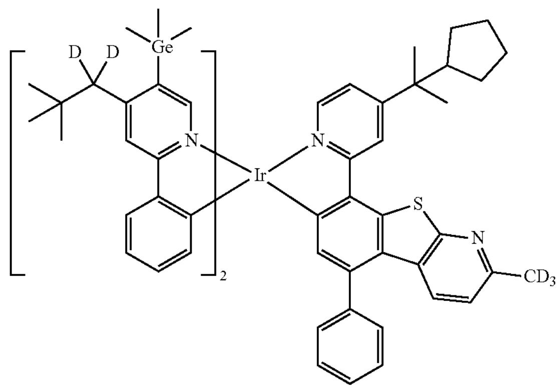
1334
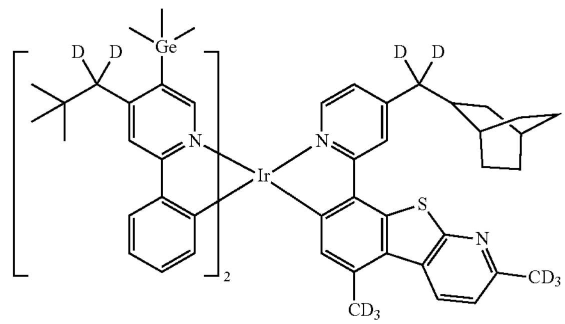

-continued
1335
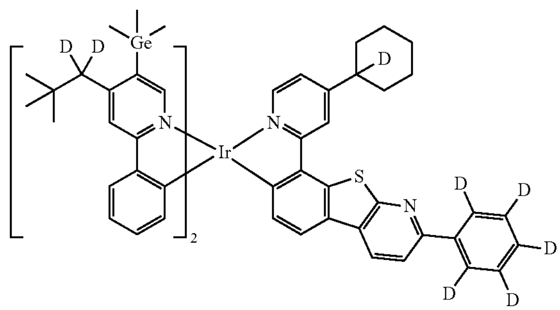
1336
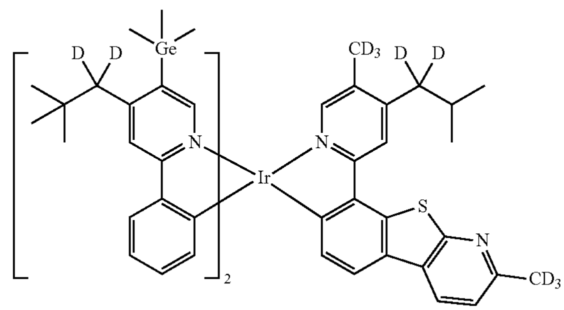
1337
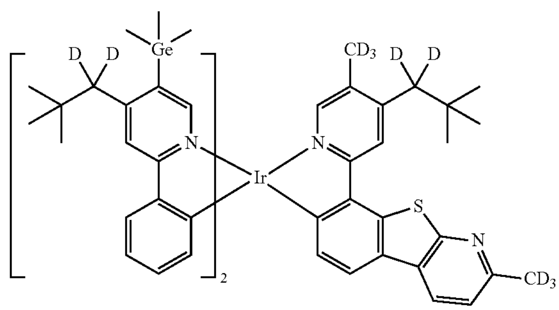
1338
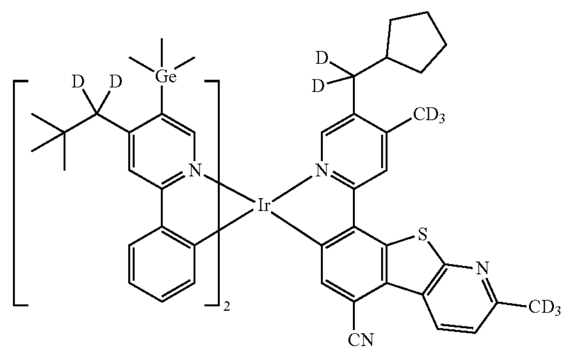
1339
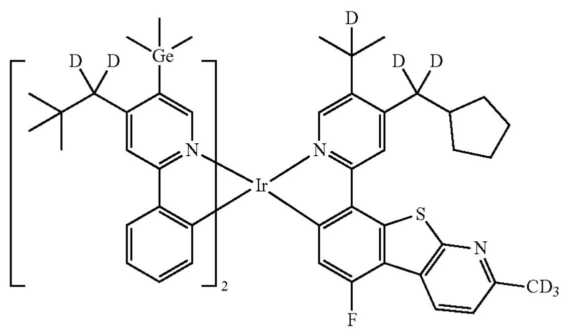
1340
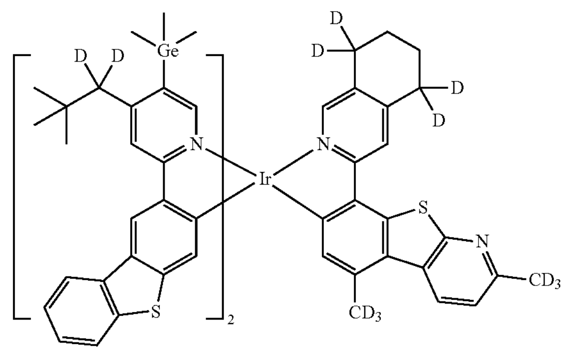
1341
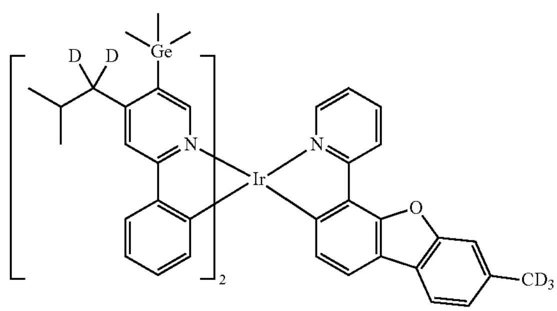
1342
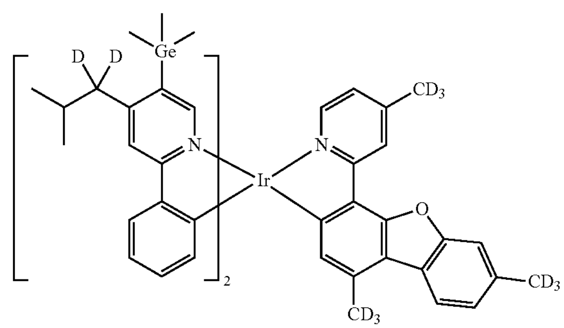

-continued
1343
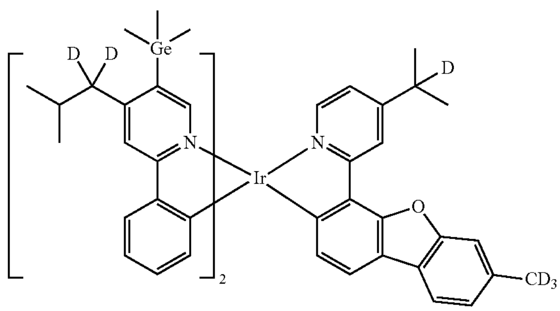
1344
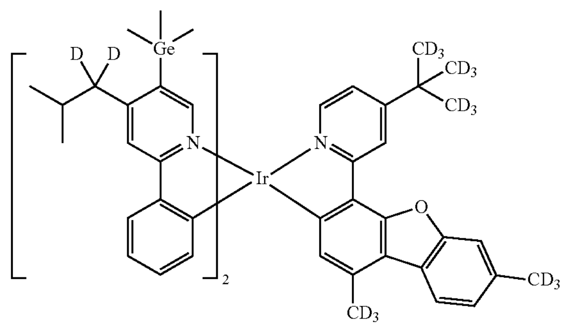
1345
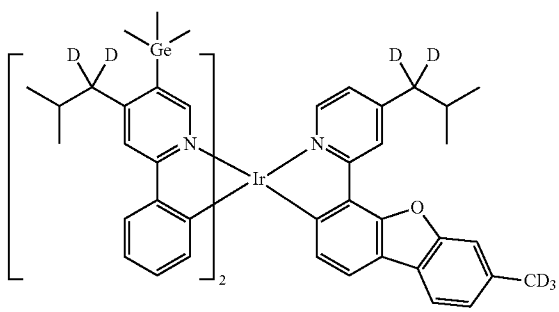
1346
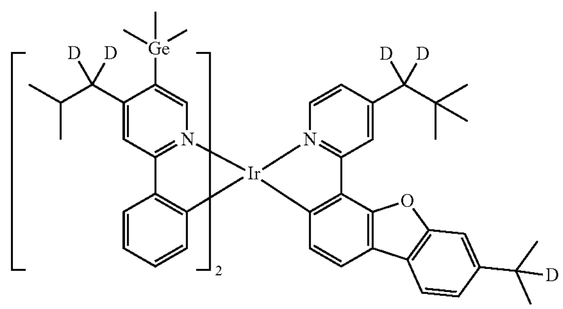
1347
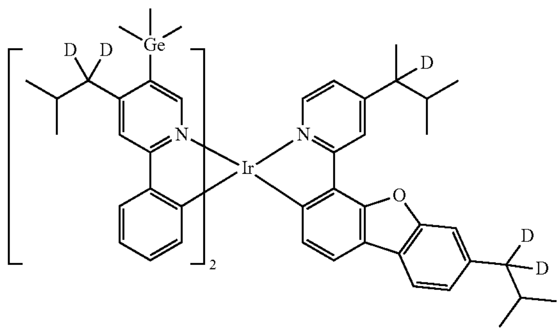
1348
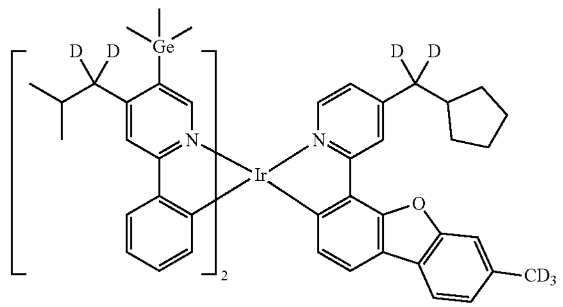
1349
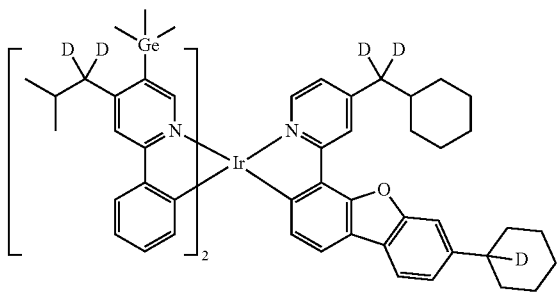
1350
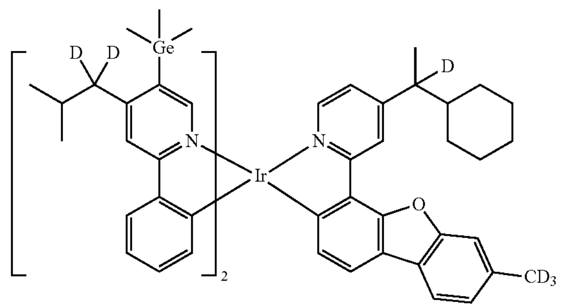

-continued
1351
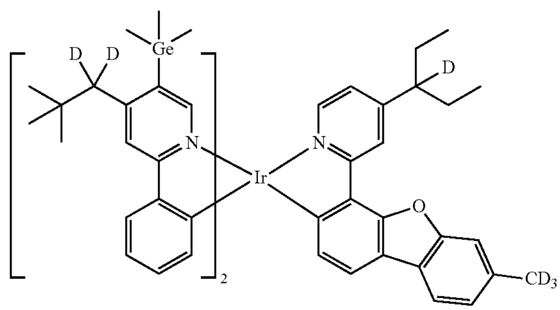
1352
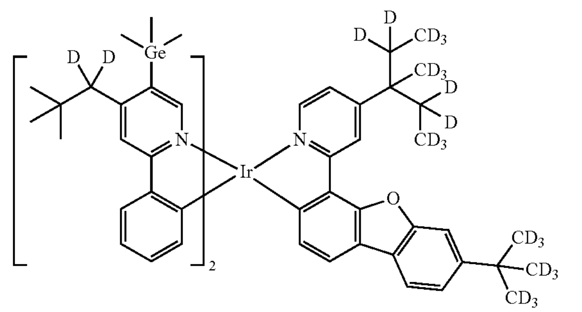
1353
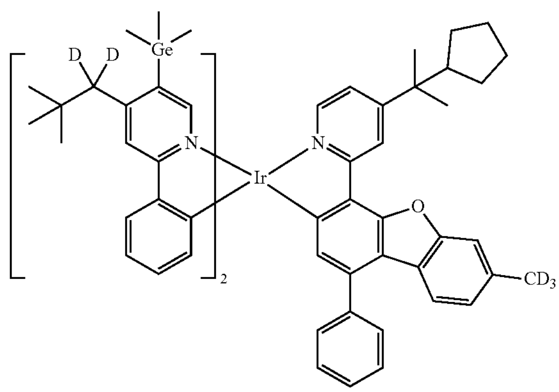
1354
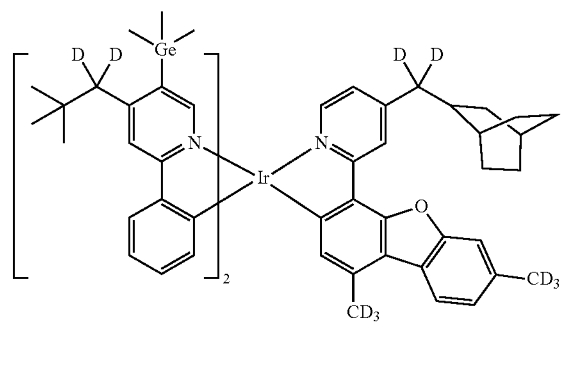
1355
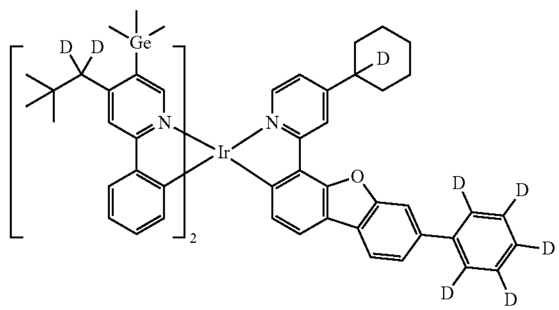
1356
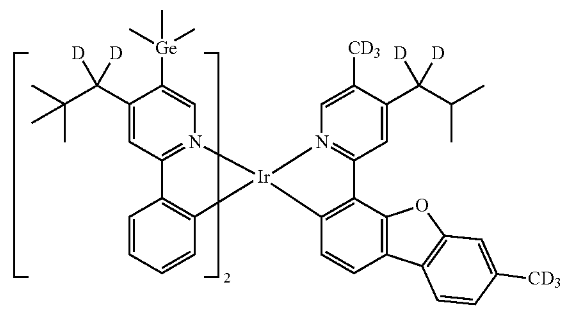
1357
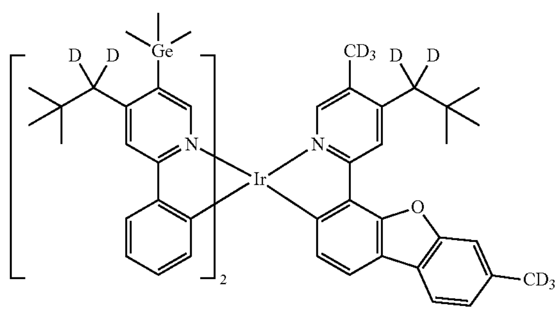
1358
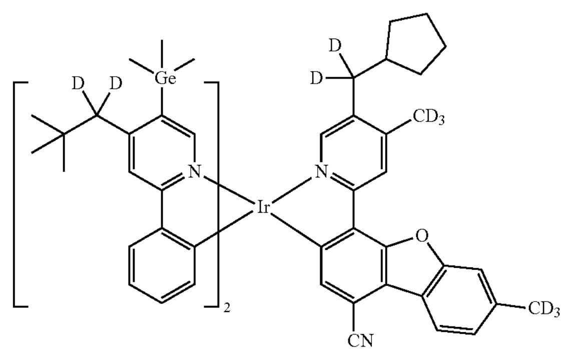

-continued
1359
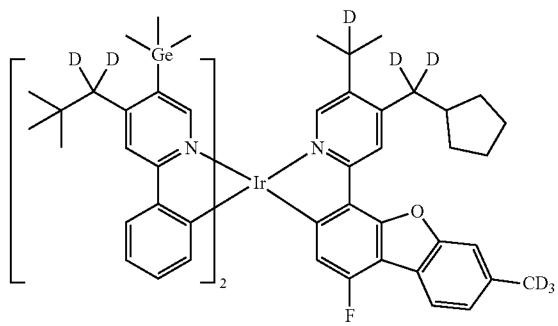
1360
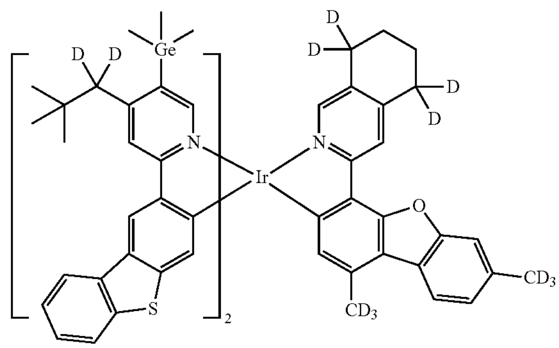
1361
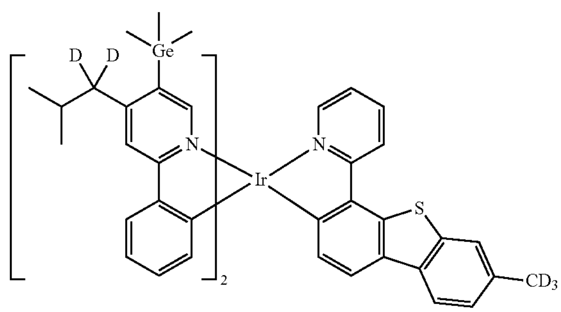
1362
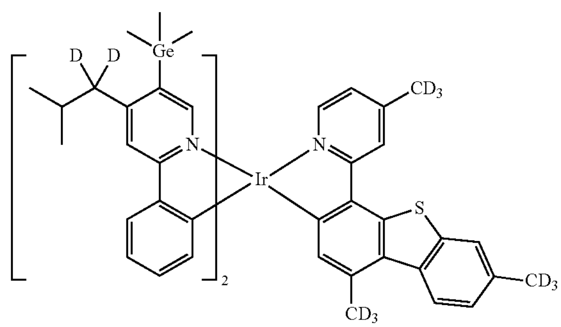
1363
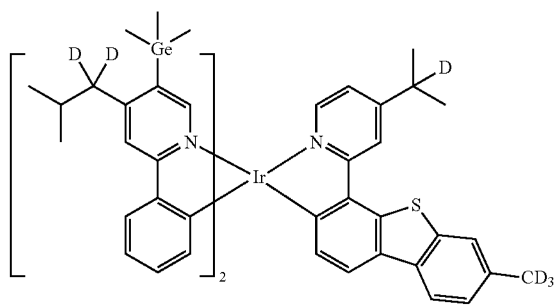
1364
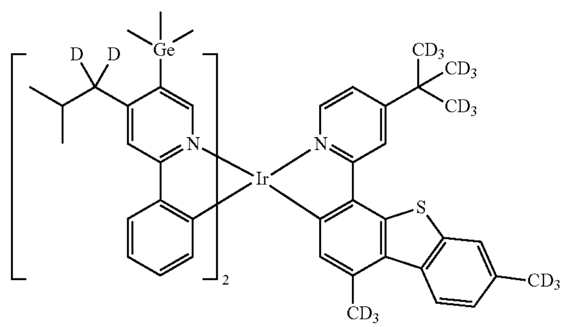
1365
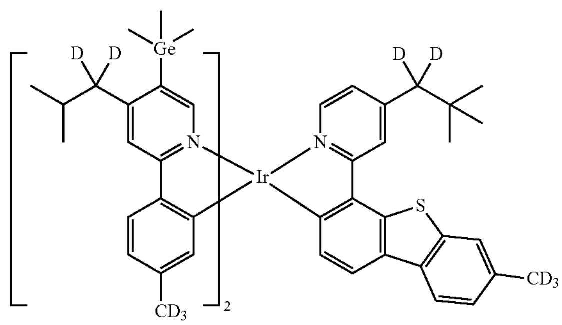
1366
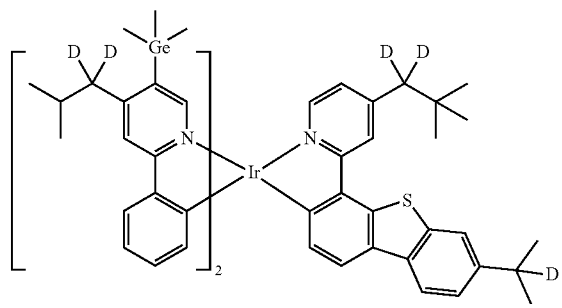

-continued
1367
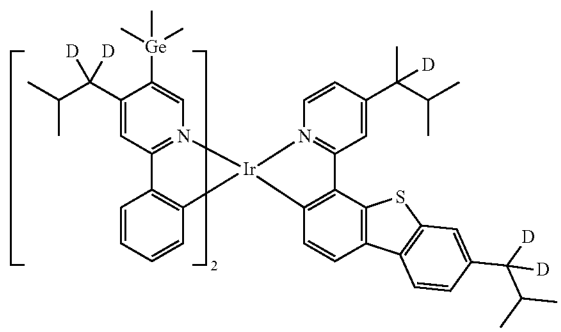
1368
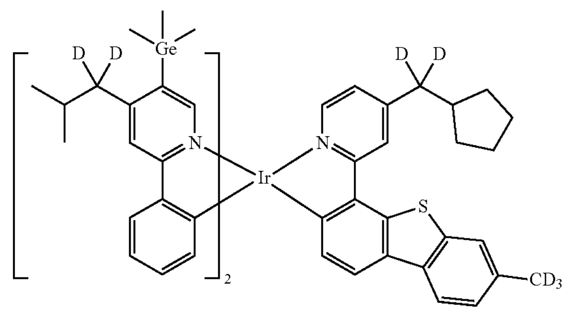
1369
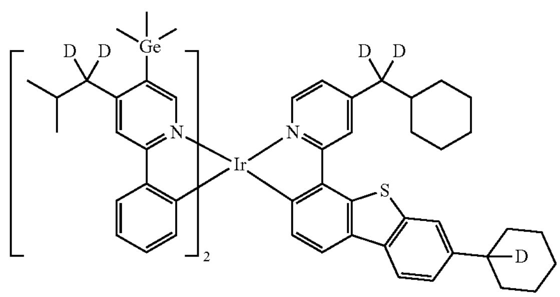
1370
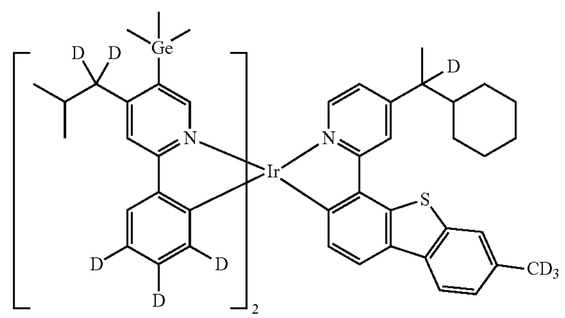
1371
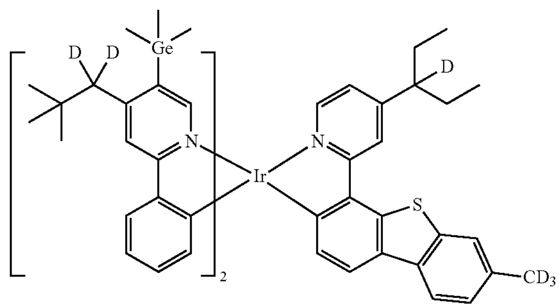
1372
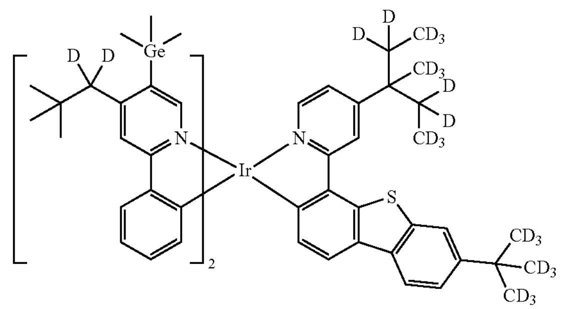
1373
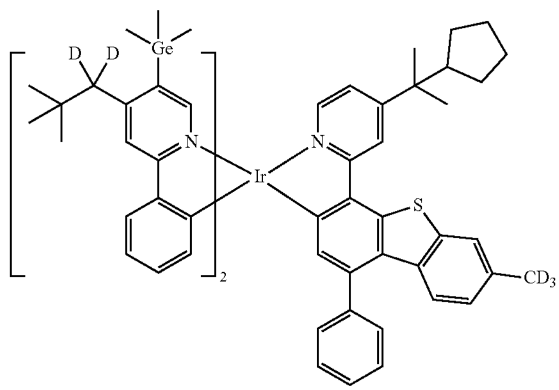
1374
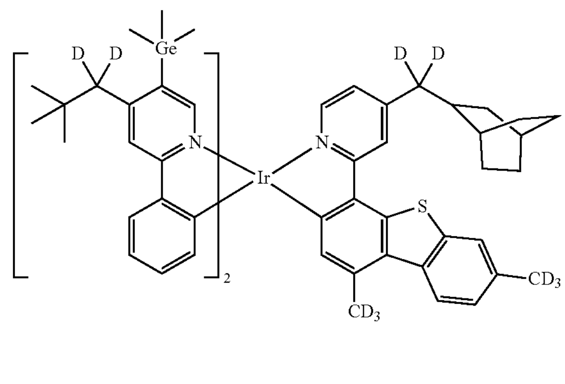

-continued
1375
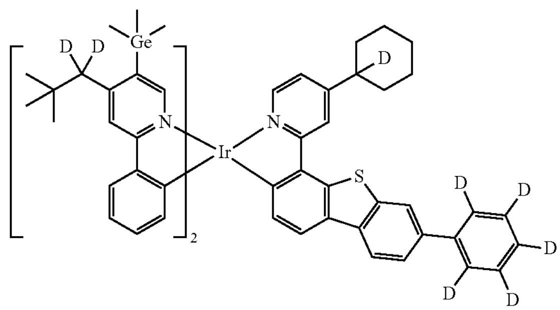
1376
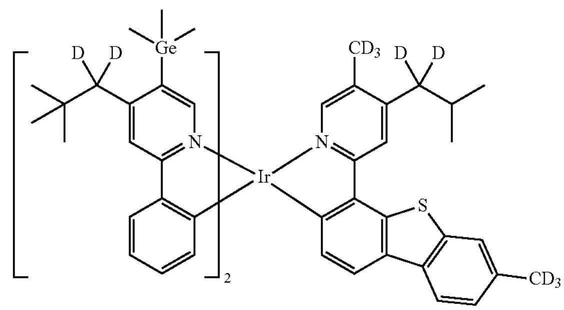
1377
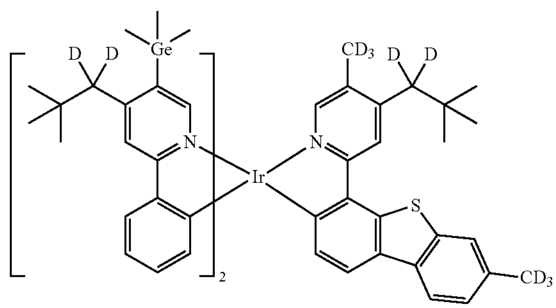
1378
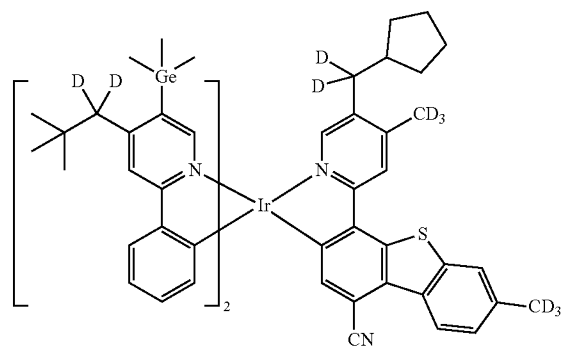
1379
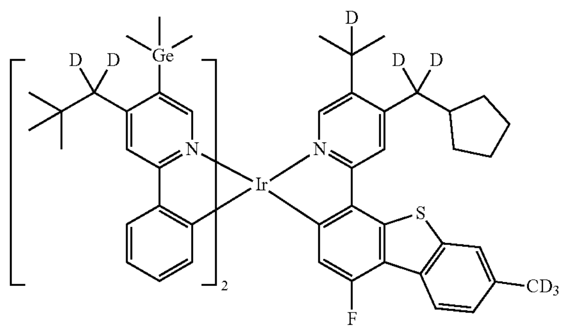
1380
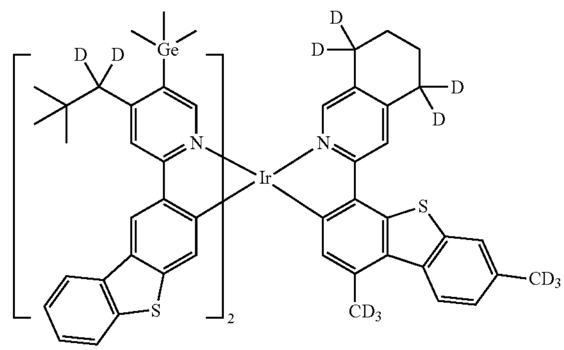
1381
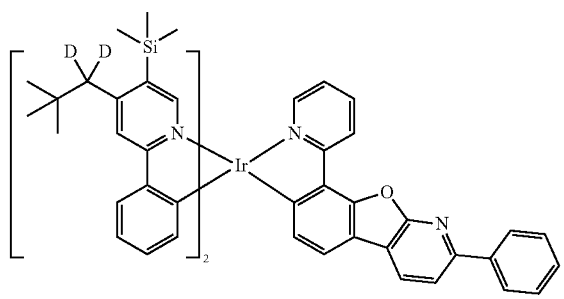
1382
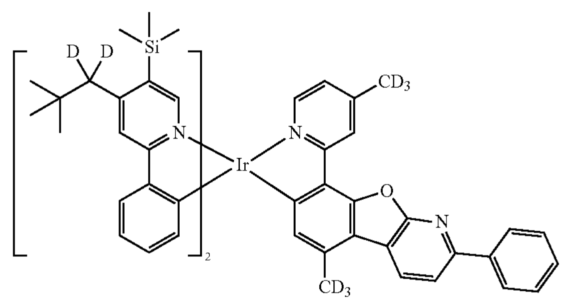

-continued
1383
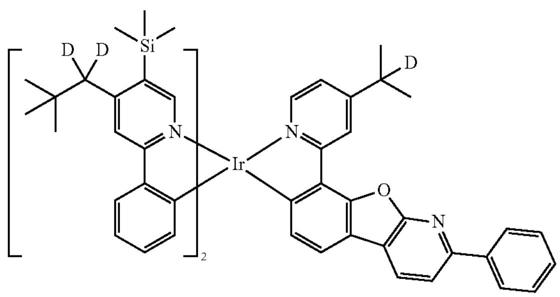
1384
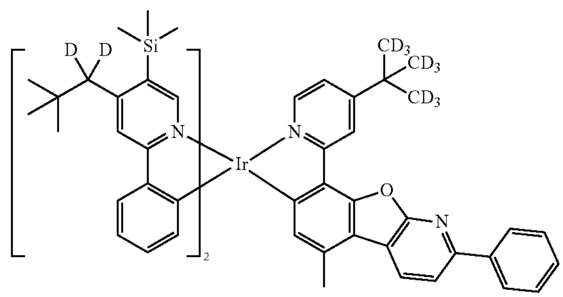
1385
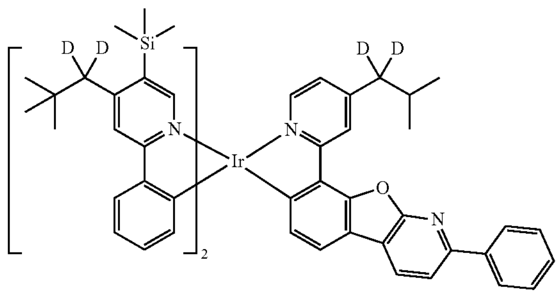
1386
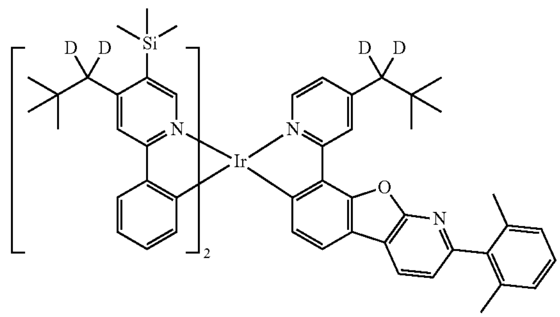
1387
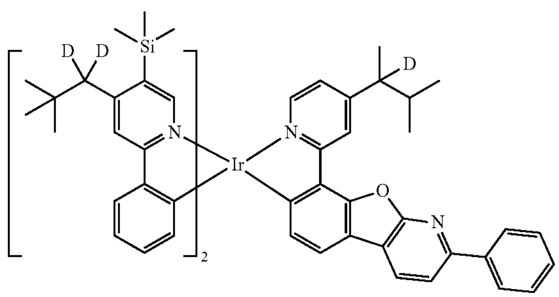
1388
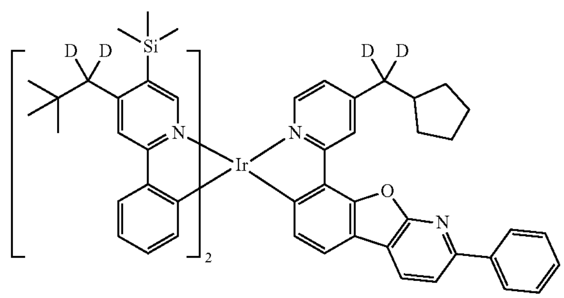
1389
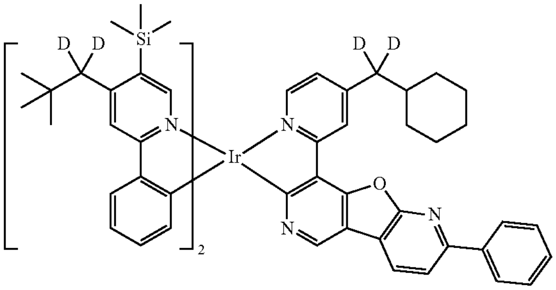
1390
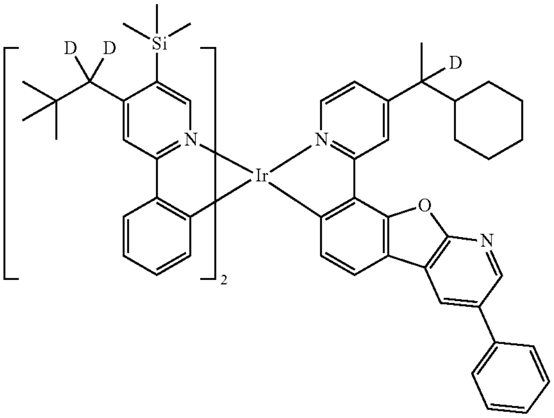

-continued
1391
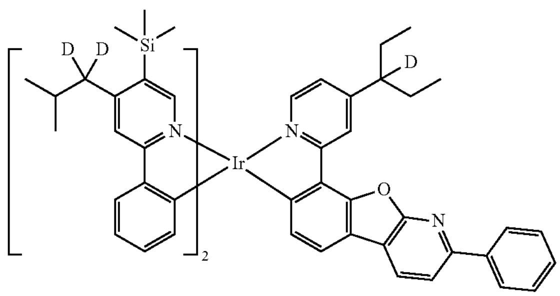
1392
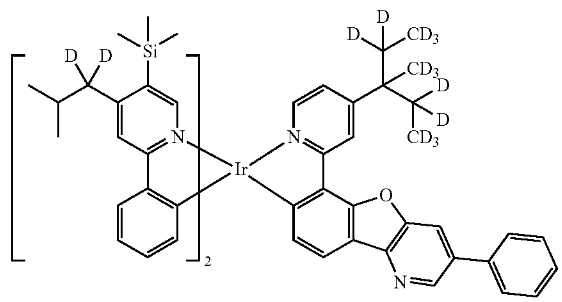
1393
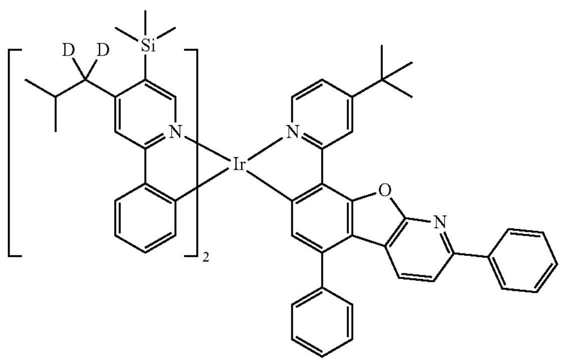
1394
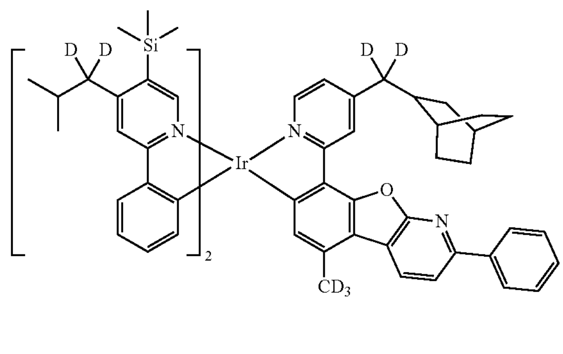
1395
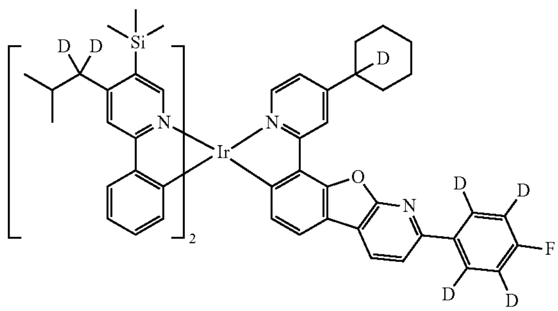
1396
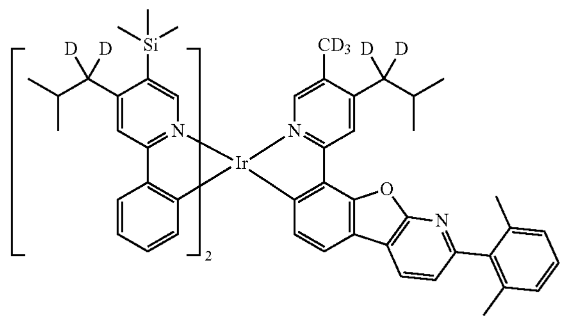
1397
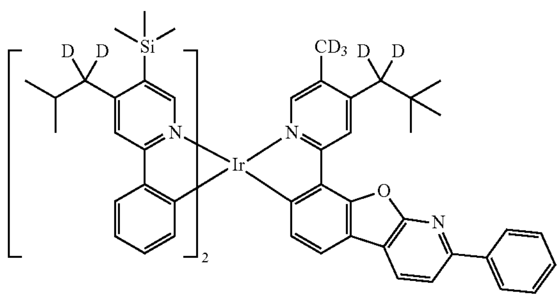
1398
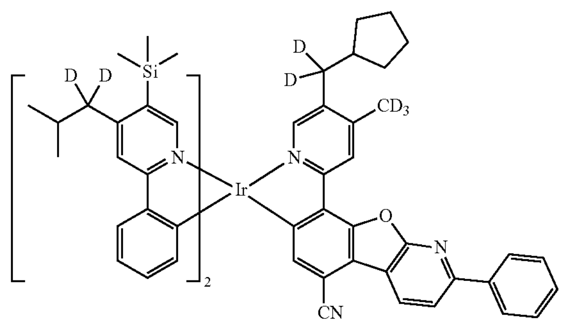

-continued
1399
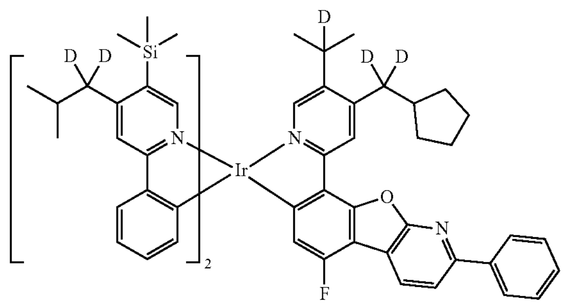
1400
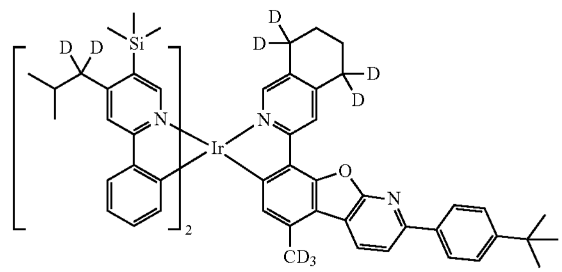
1401
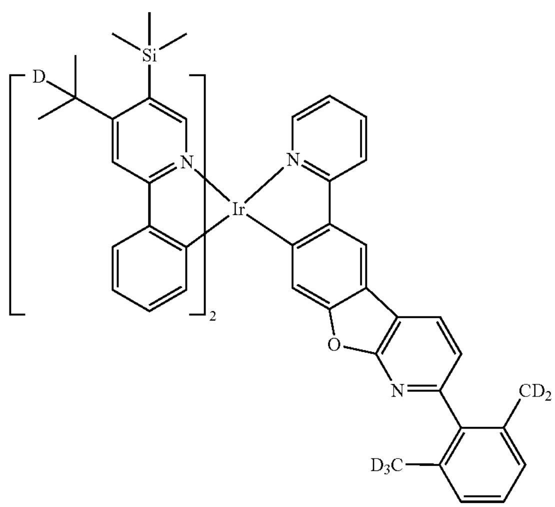
1402
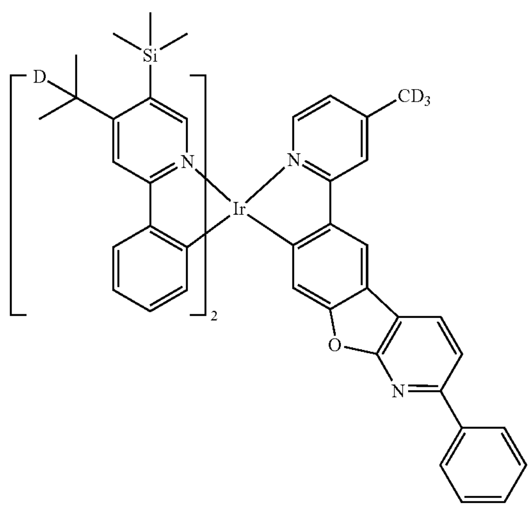
-continued
1403
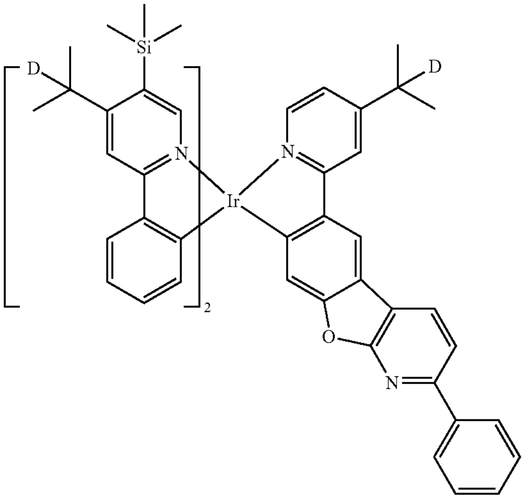
1404
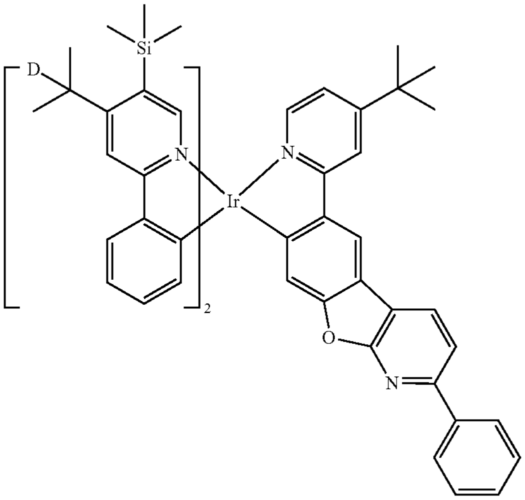

-continued
1405
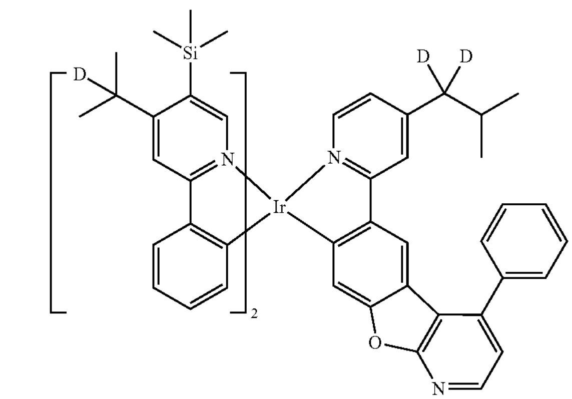
1406
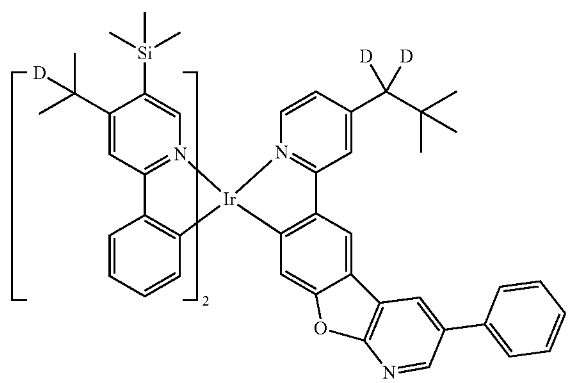
1407
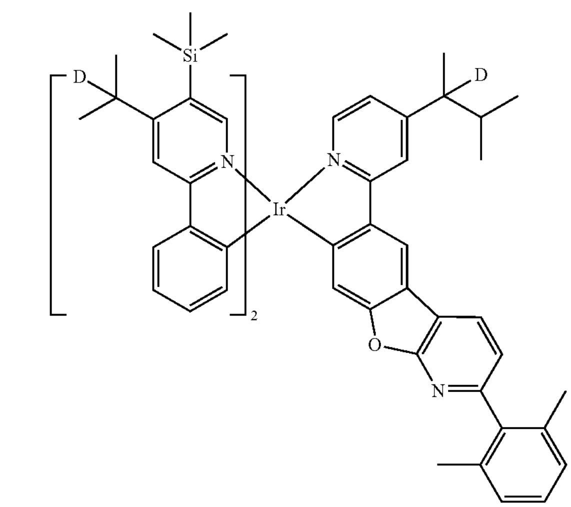
-continued
1408
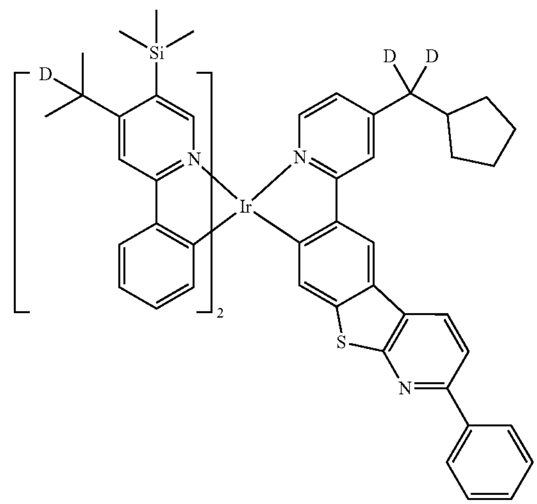
1409
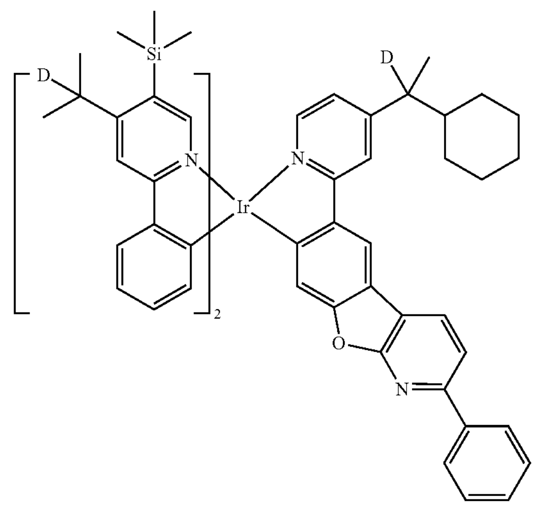
1410
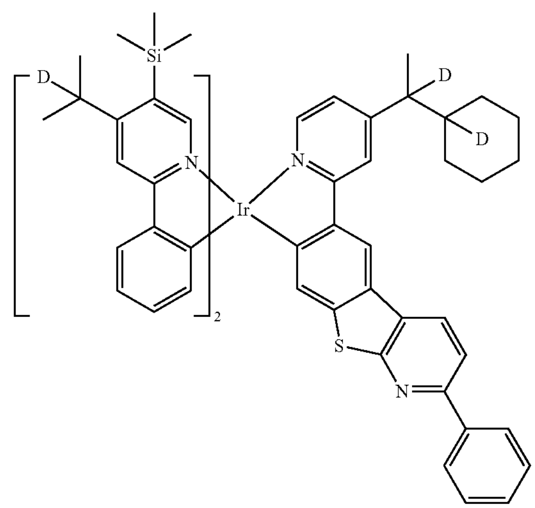

-continued
1411
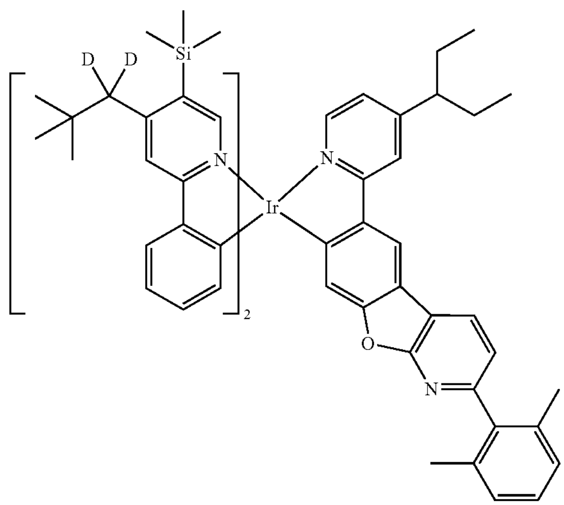
1412
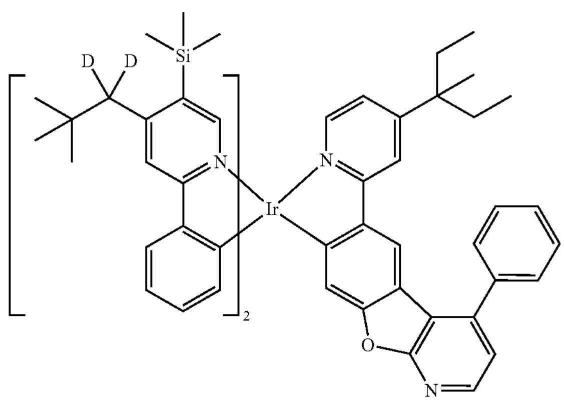
1413
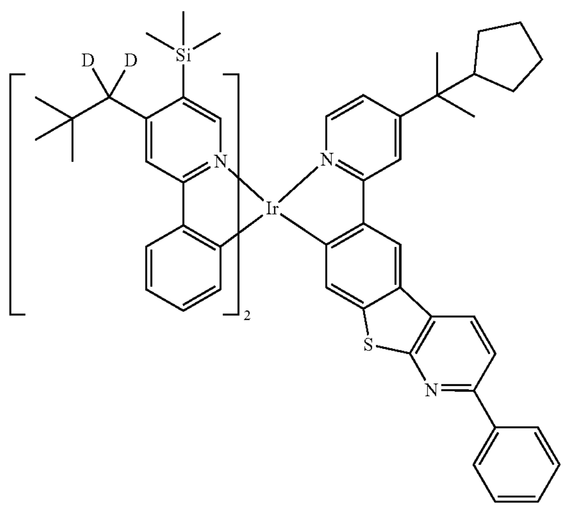
-continued
1414
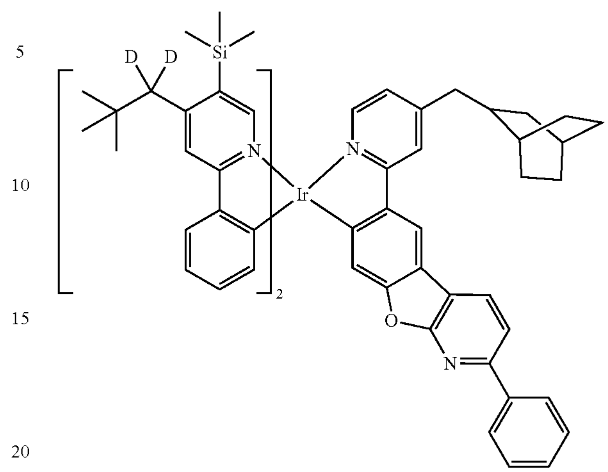
1415
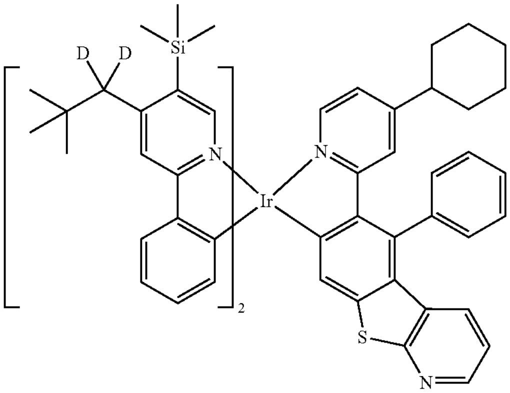
1416
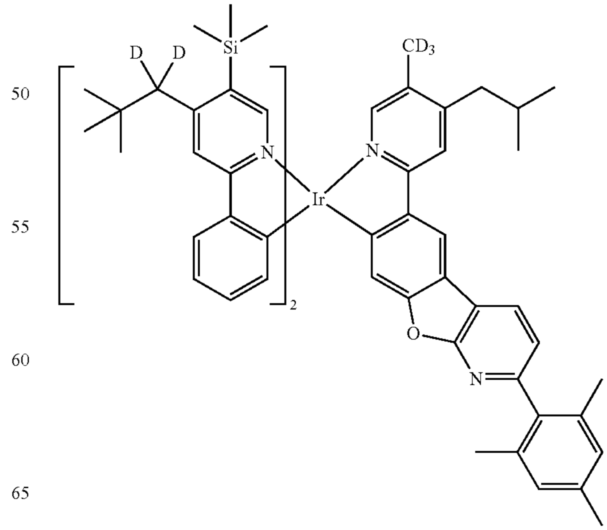

1417
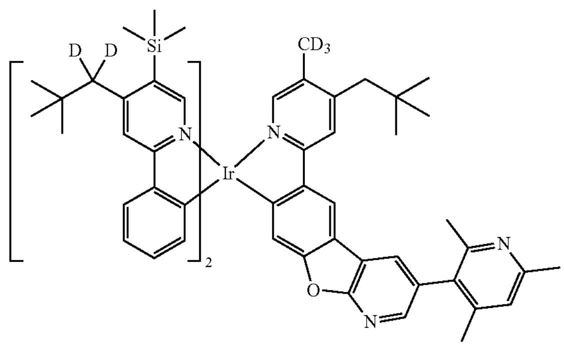
1418
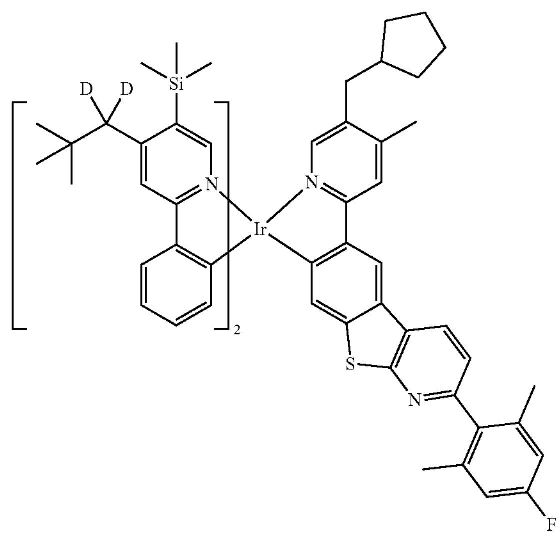
1419
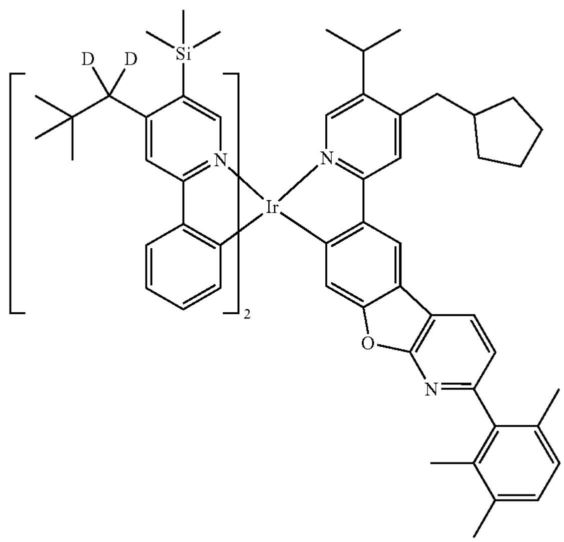
1420
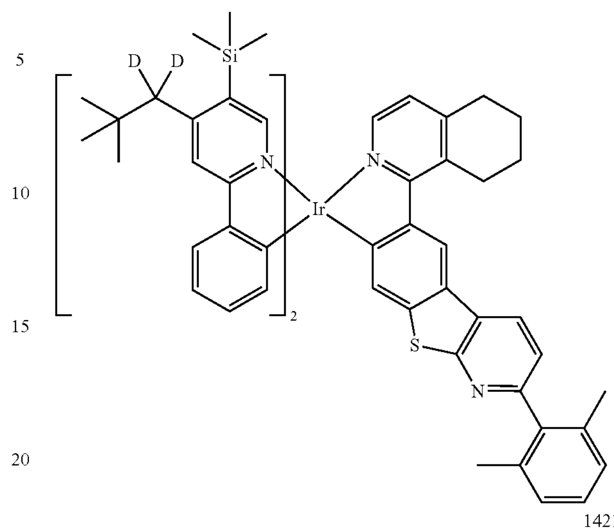
1421
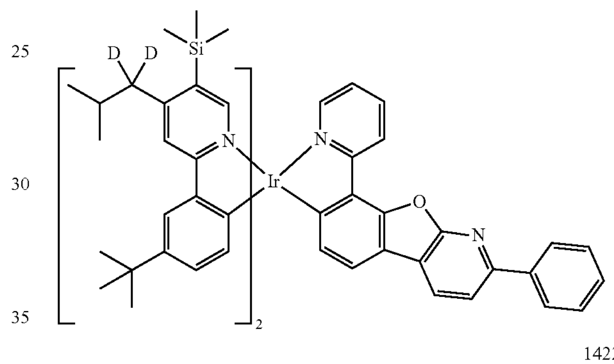
1422
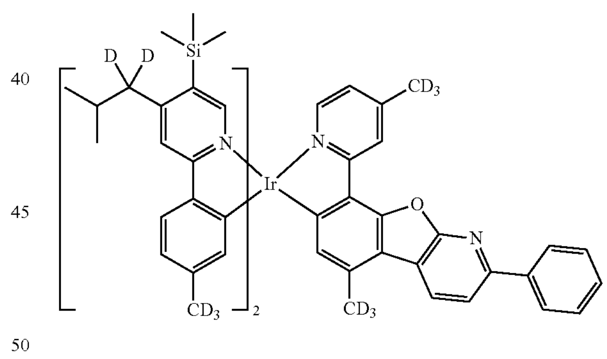
1423
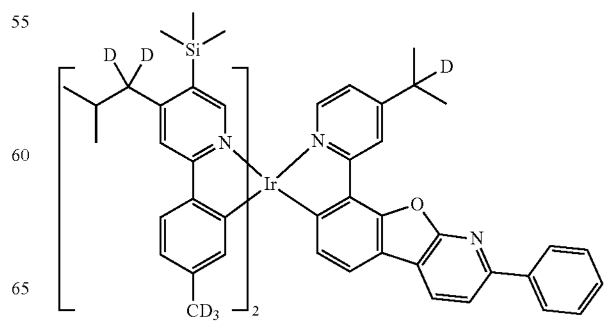

-continued
1424
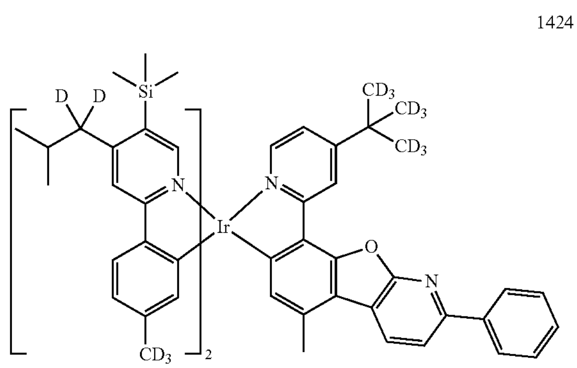
1425
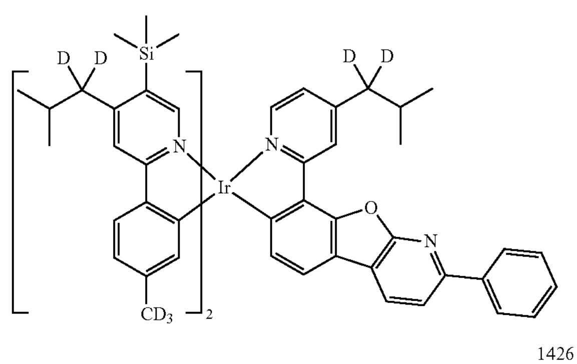
1426
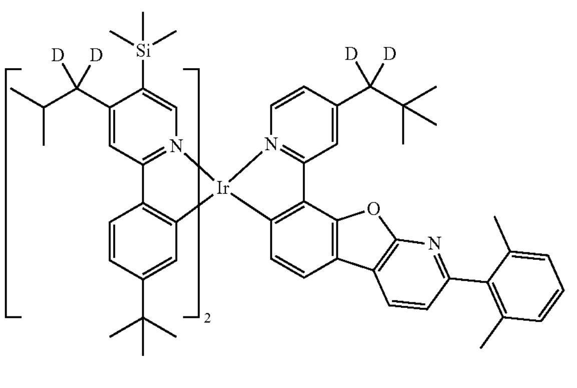
1427
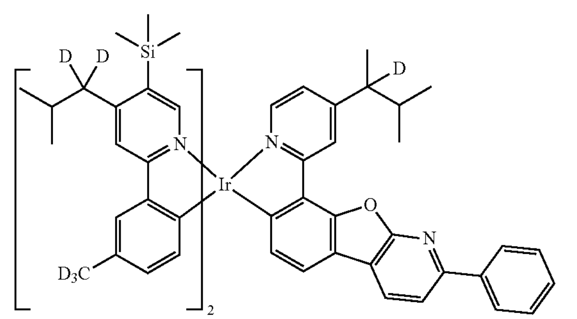
-continued
1428
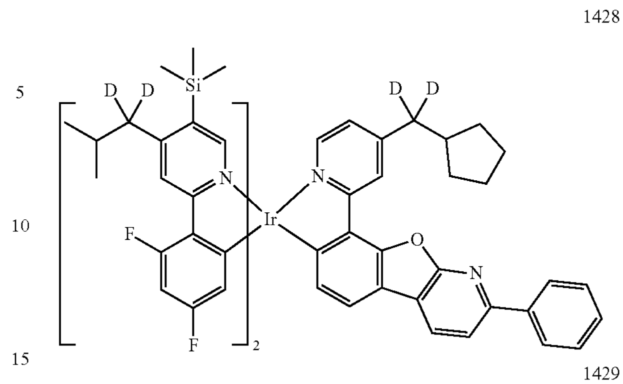
1429
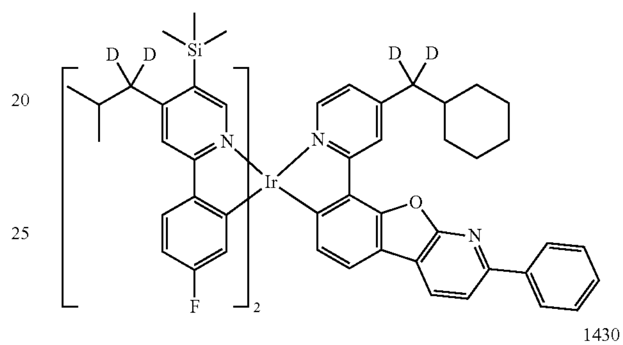
1430
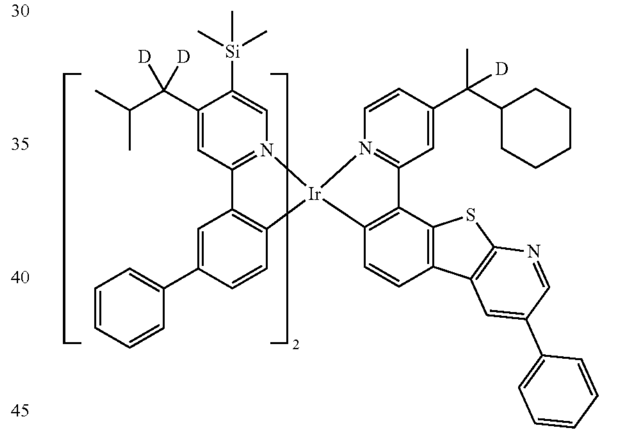
1431
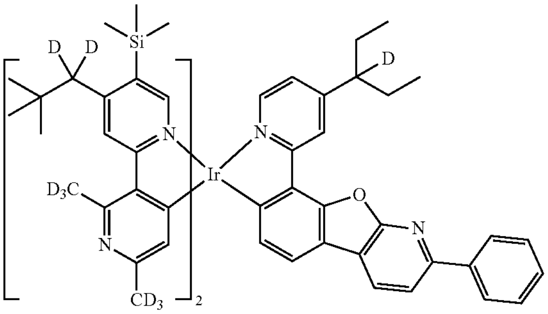

-continued
1432
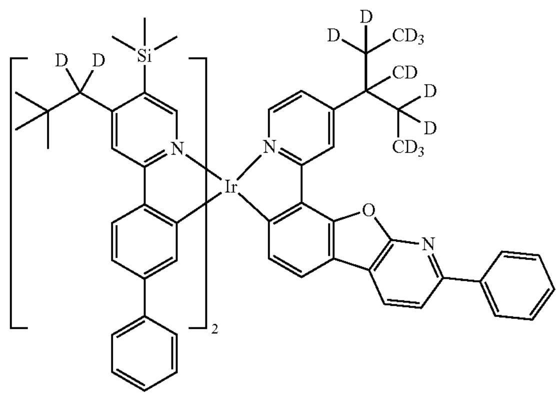
1433
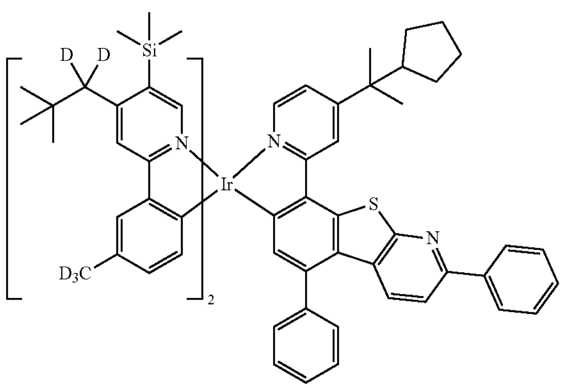
1434
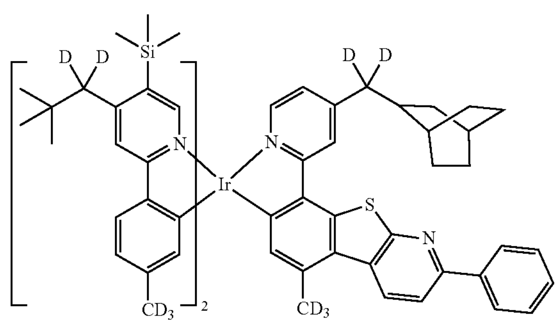
1435
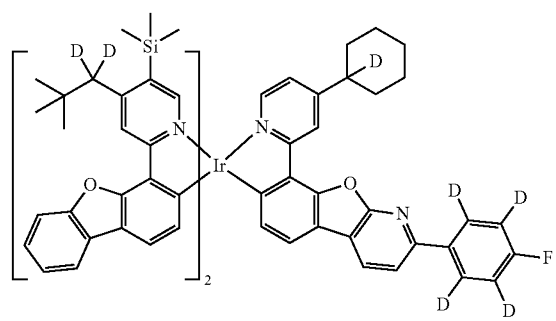
-continued
1436
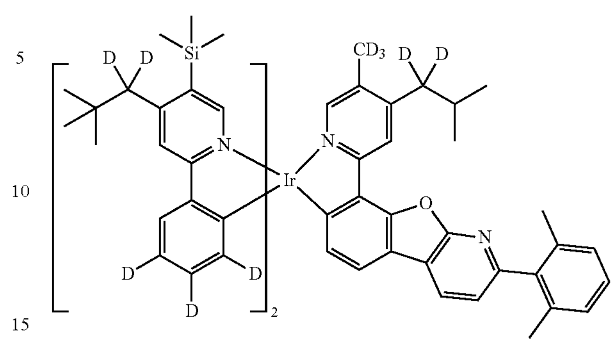
1437
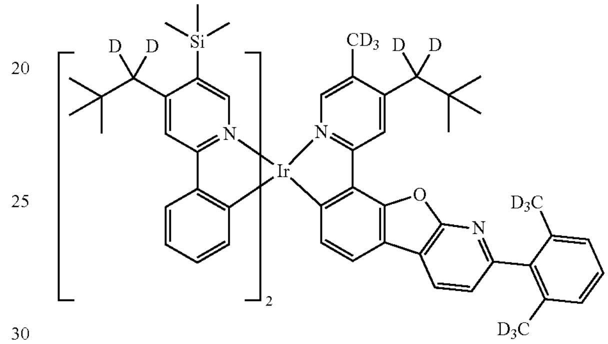
1438
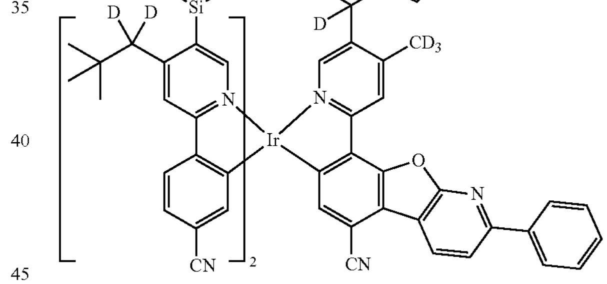
1439
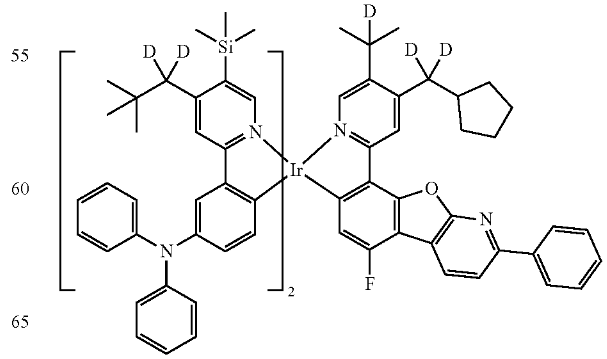

-continued
1440
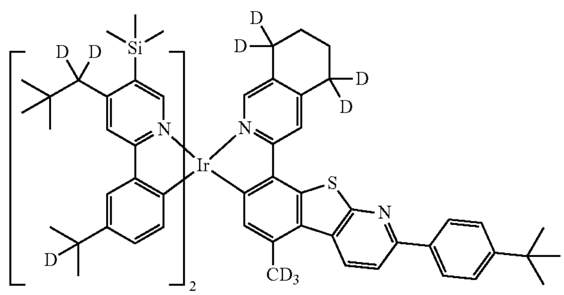
1441
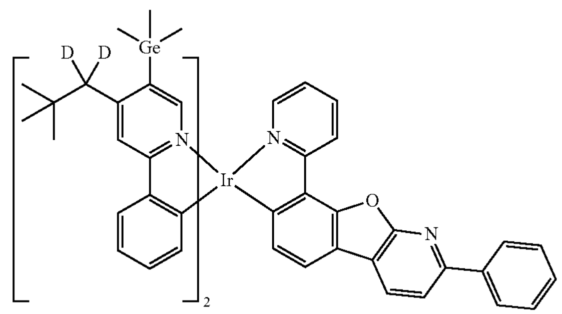
1442
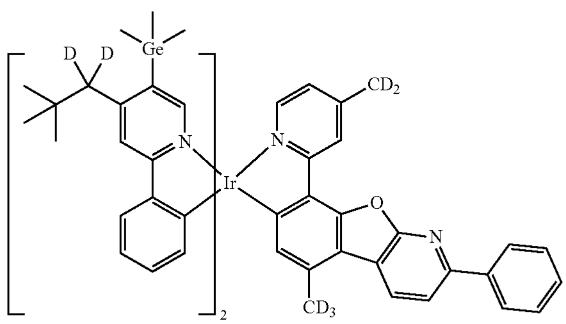
1443
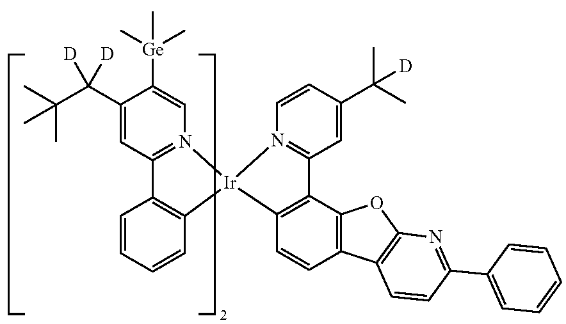
-continued
1444
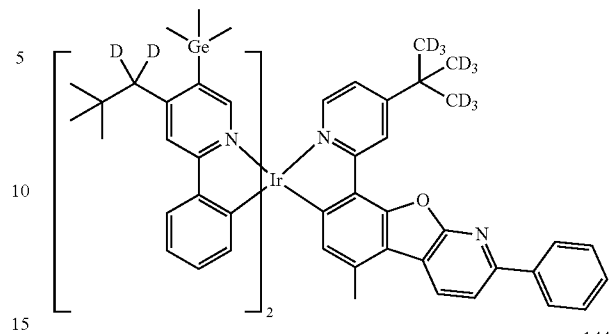
1445
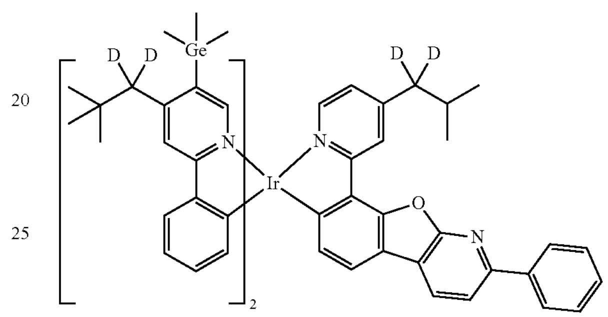
1446
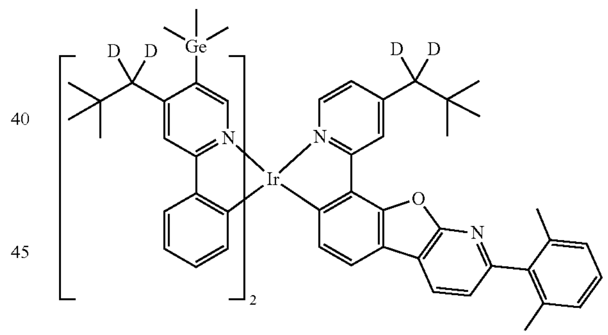
1447
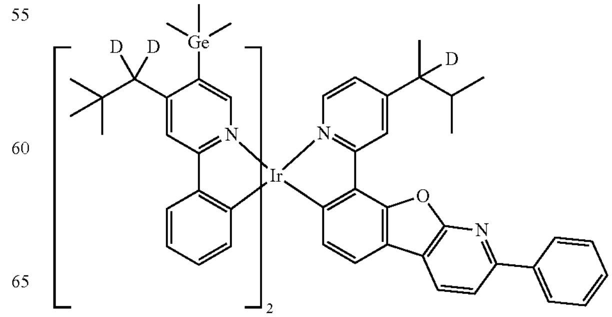

-continued
1448
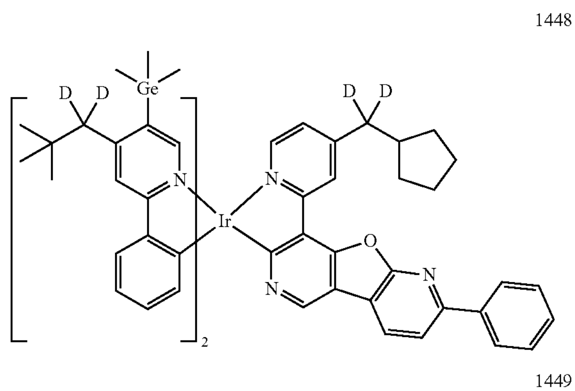
1449
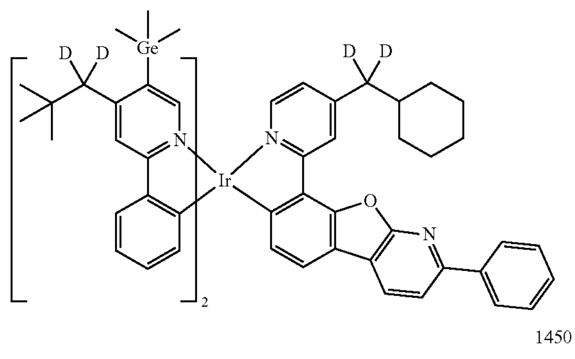
1450
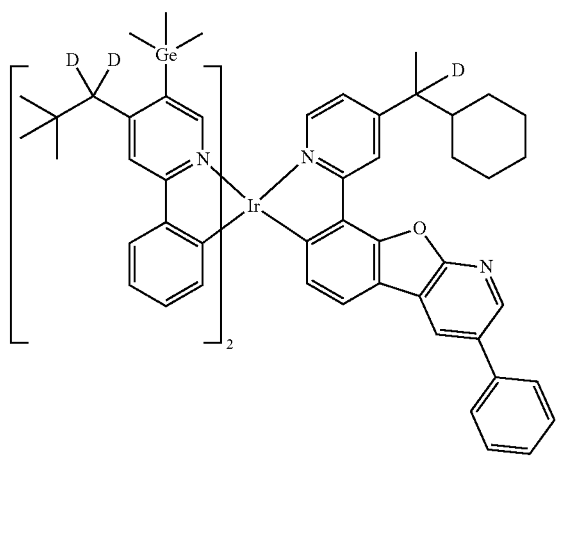
1451
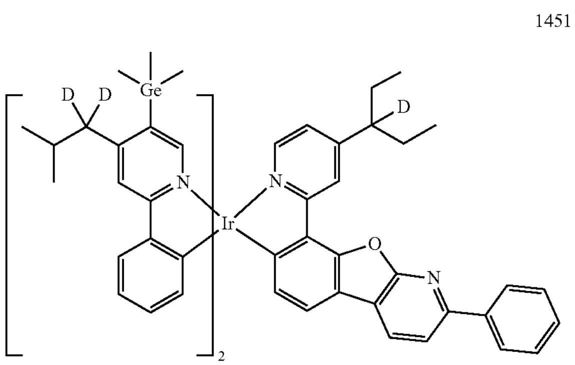
-continued
1452
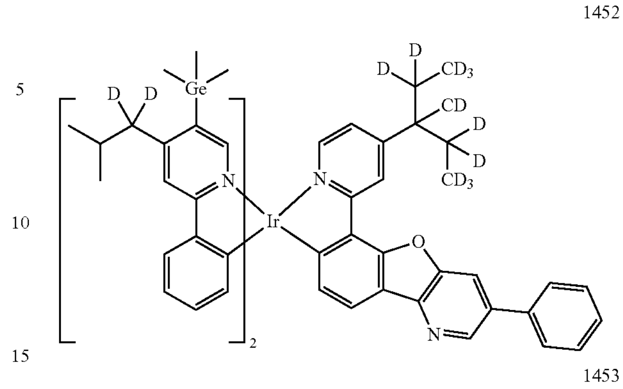
1453
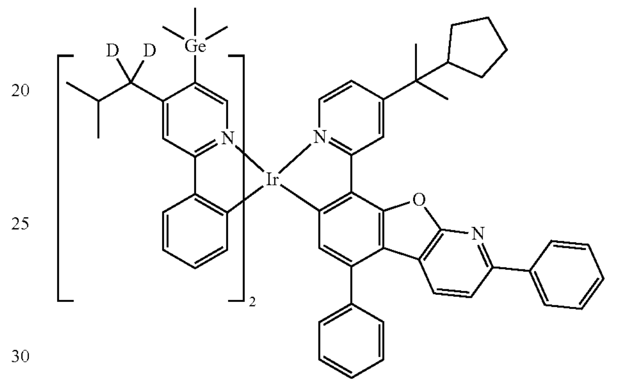
1454
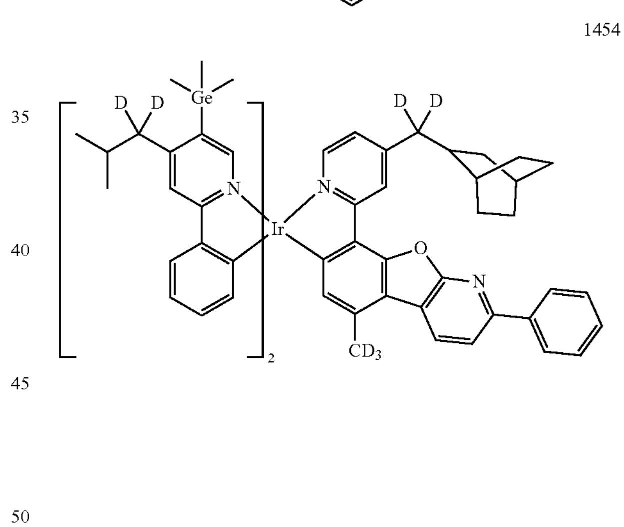
1455
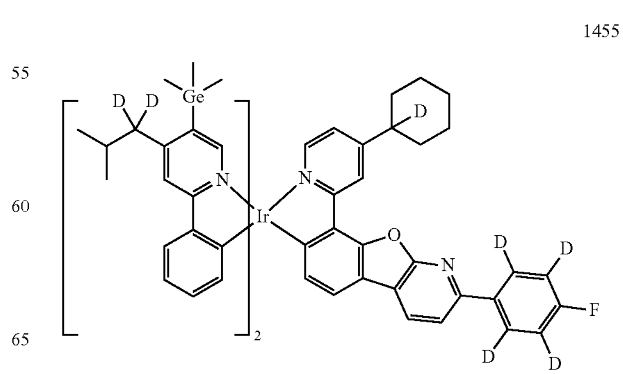

-continued
1456
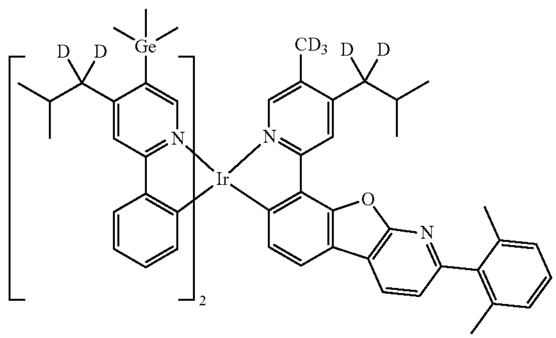
1457
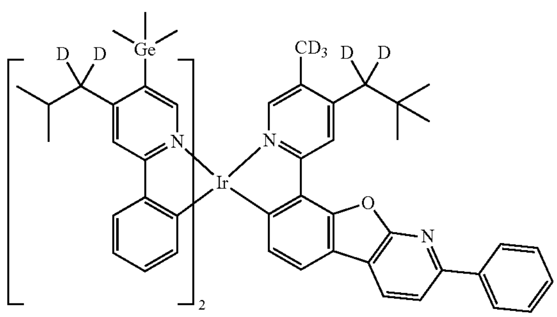
1458
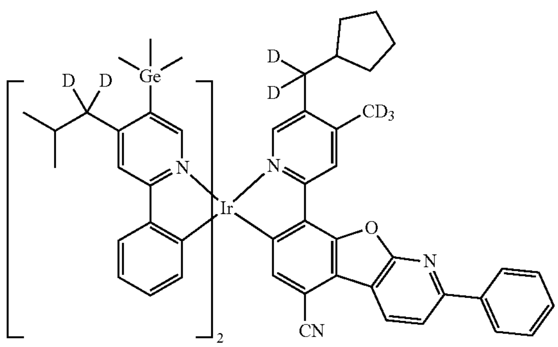
1459
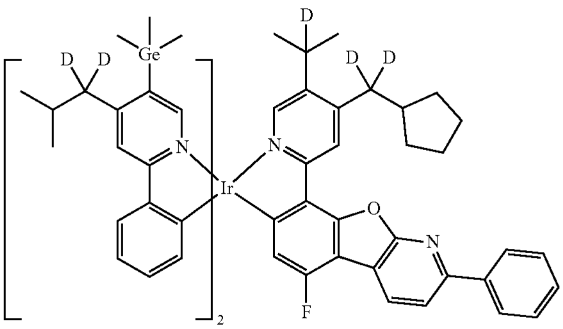
-continued
1460
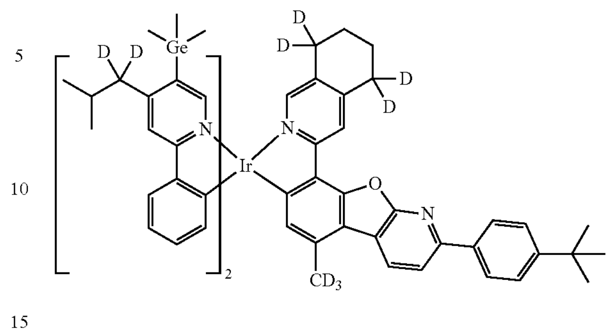
1461
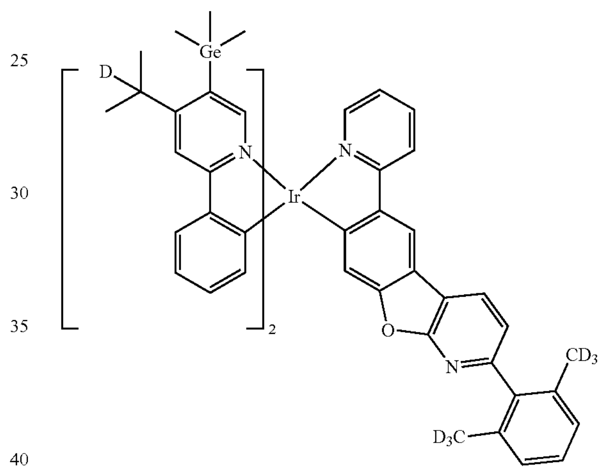
1462
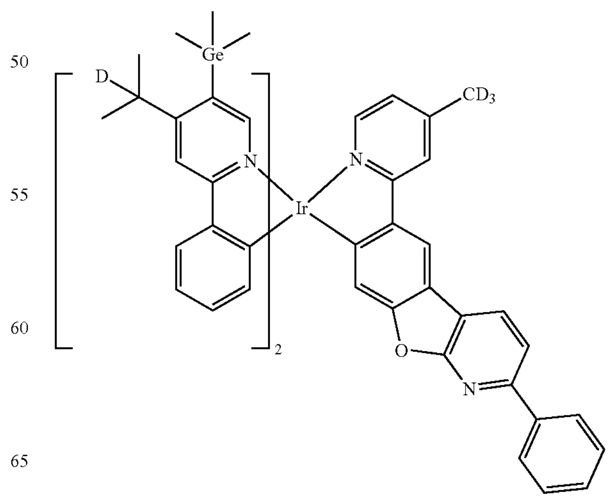

-continued
1463
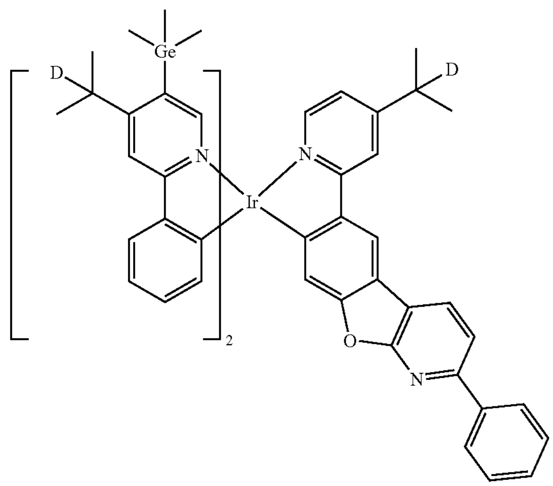
1464
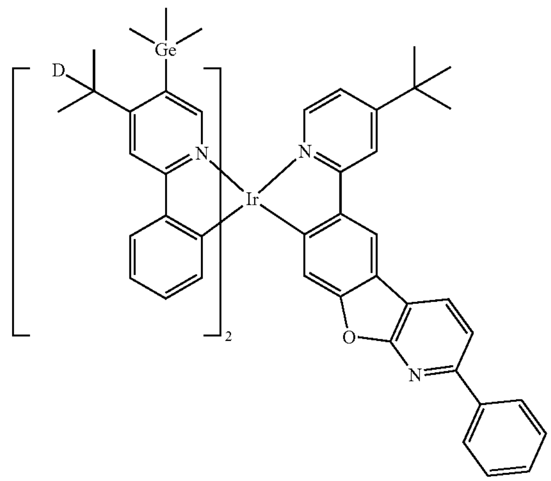
1465
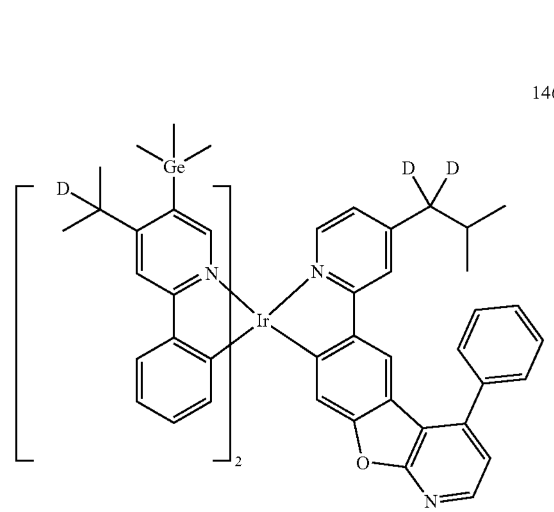
-continued
1466
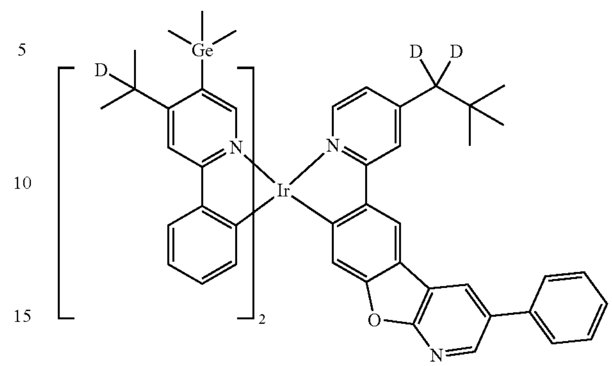
1467
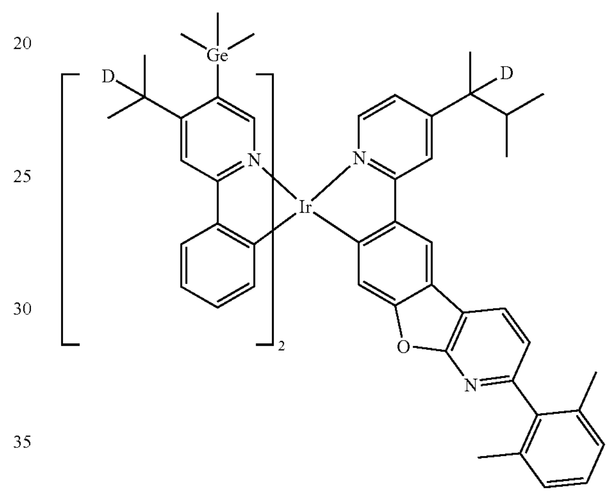
1468
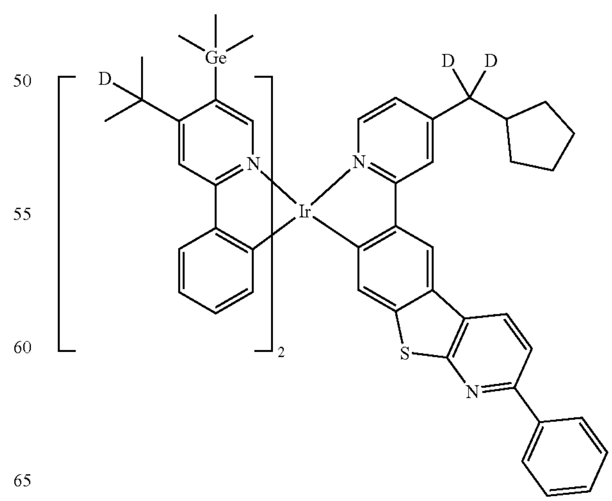

-continued
1469
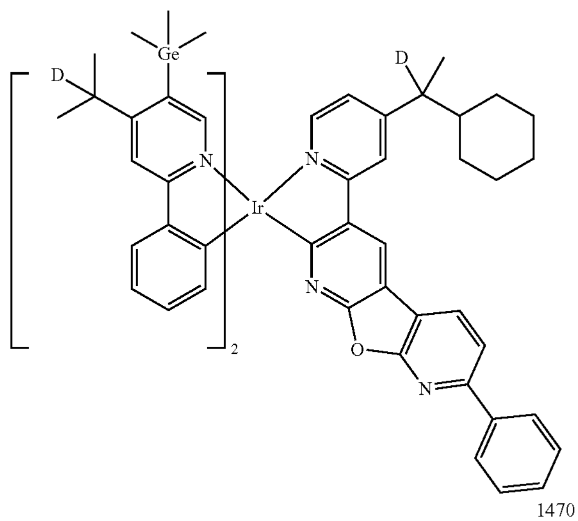
1470
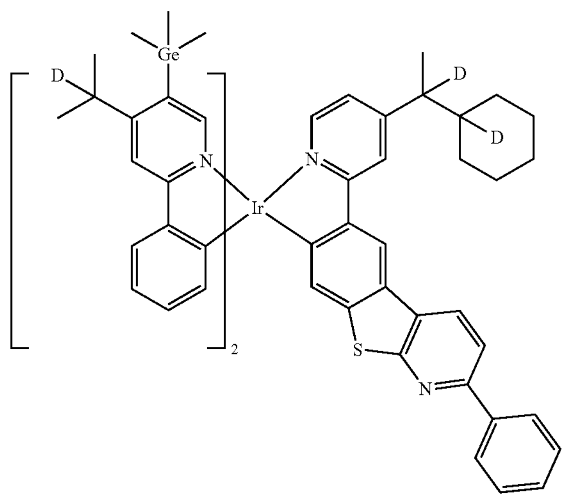
1471
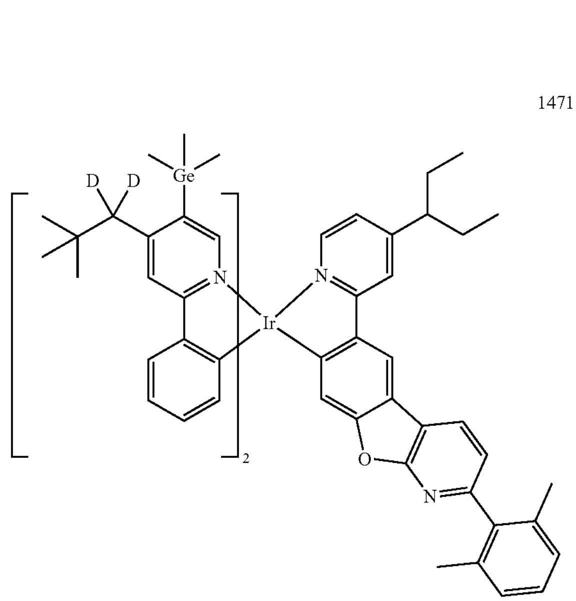
-continued
1472
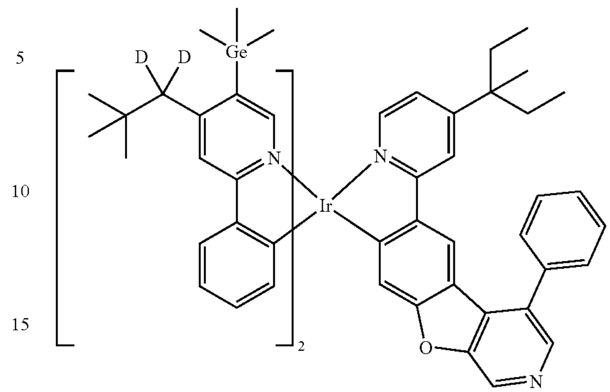
1473
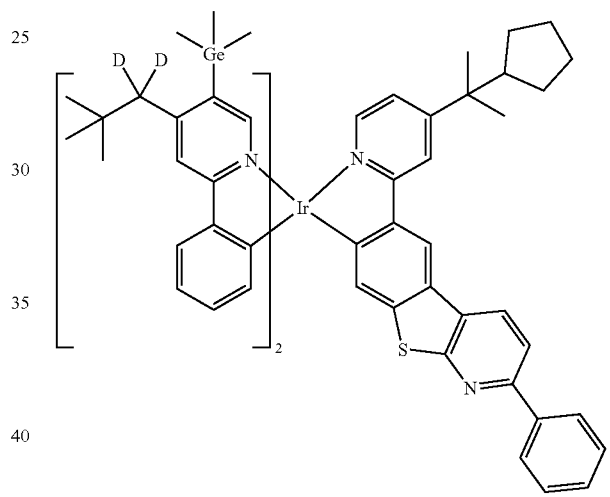
1474
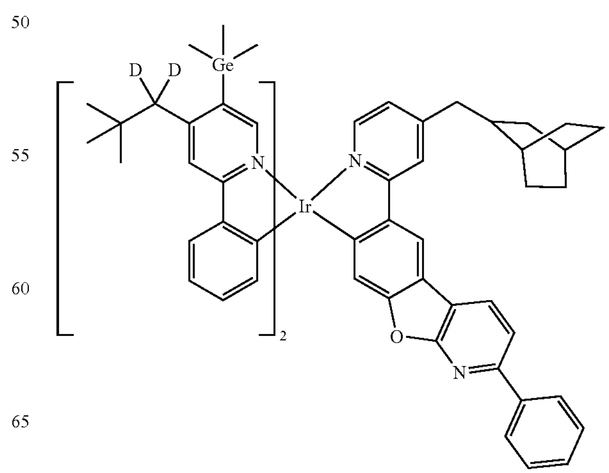

-continued
1475
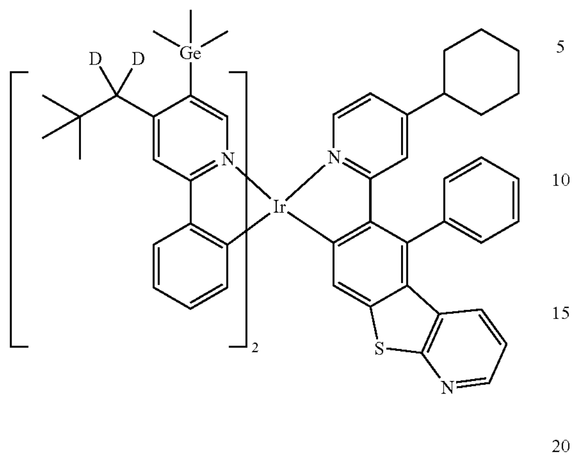
1476
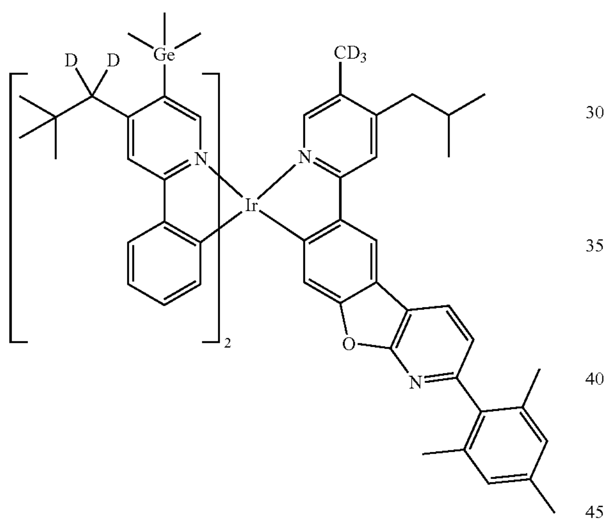
1477
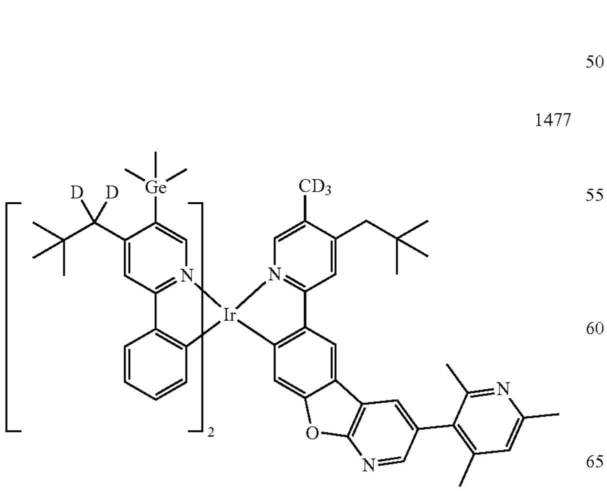
-continued
1478
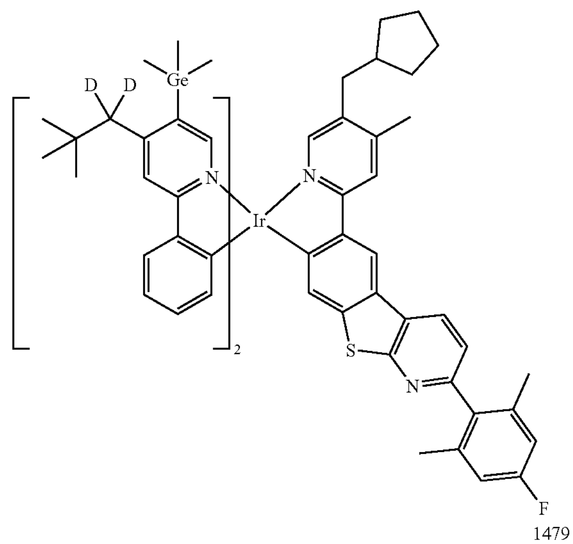
1479
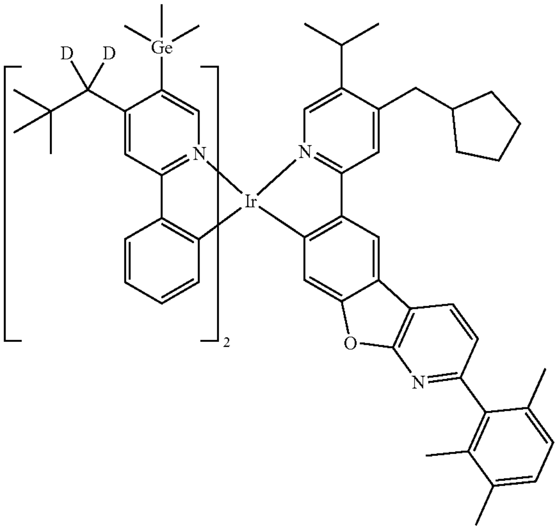
1480
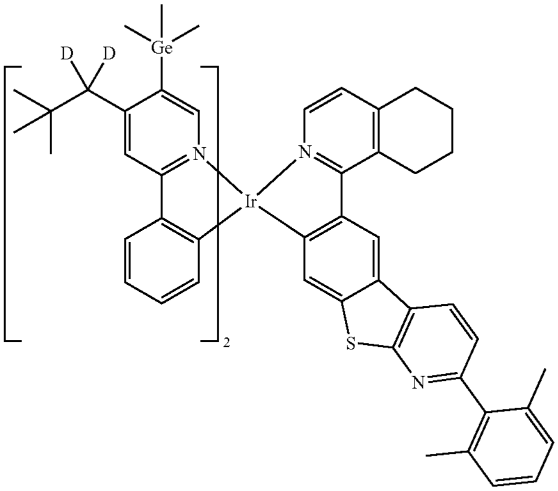

-continued
1481
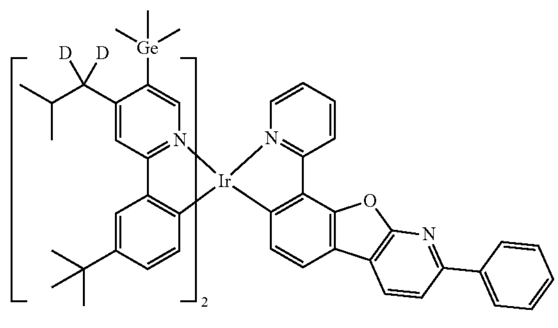
1482
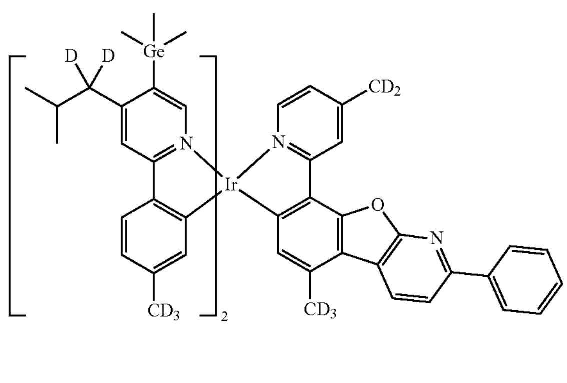
1483
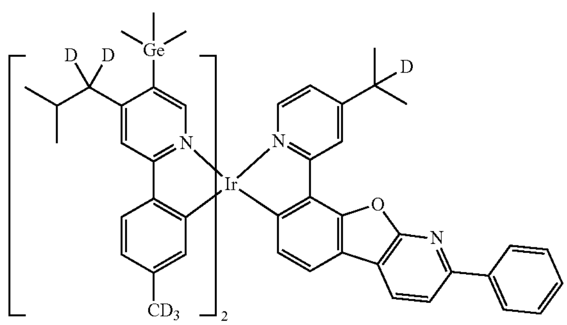
1484
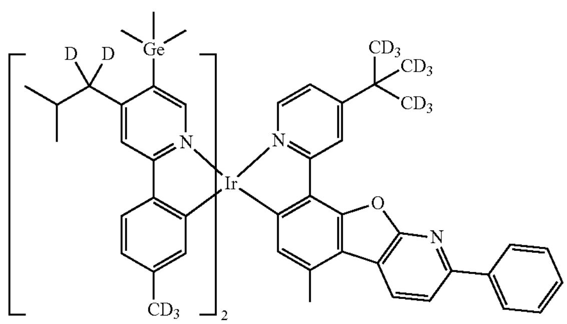
-continued
1485
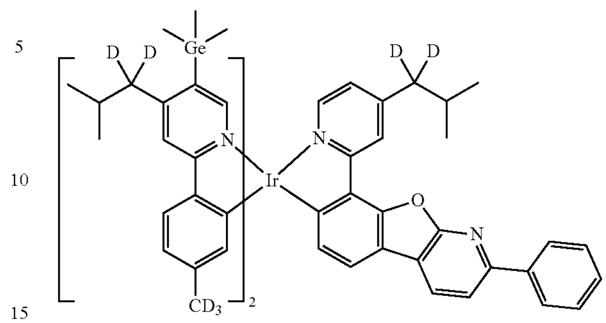
1486
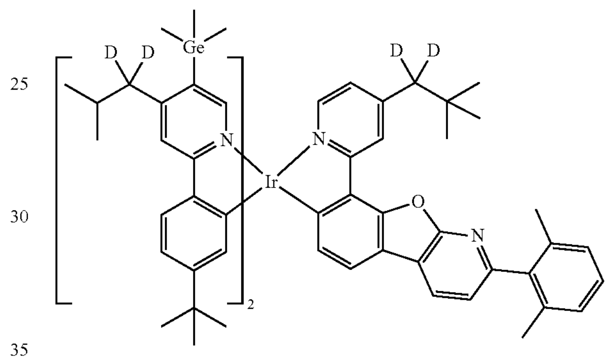
1487
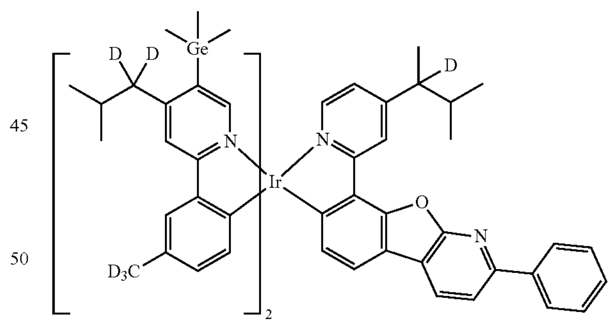
1488
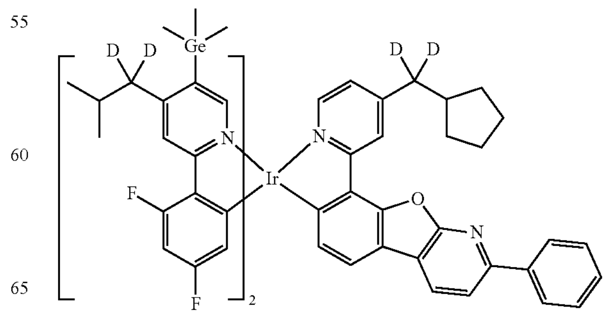

1489
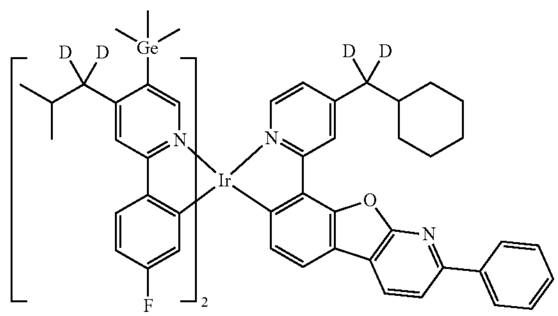
1490
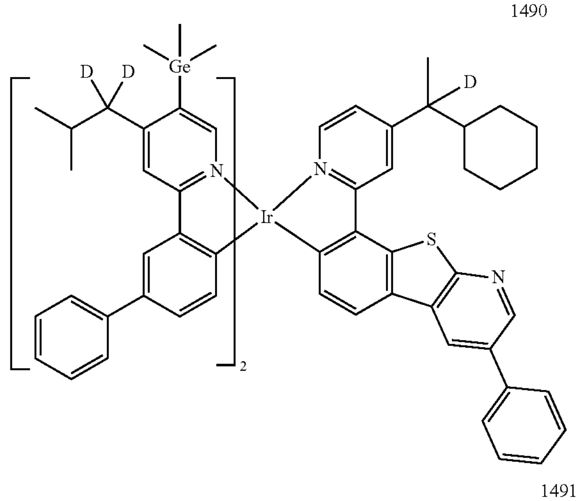
1491
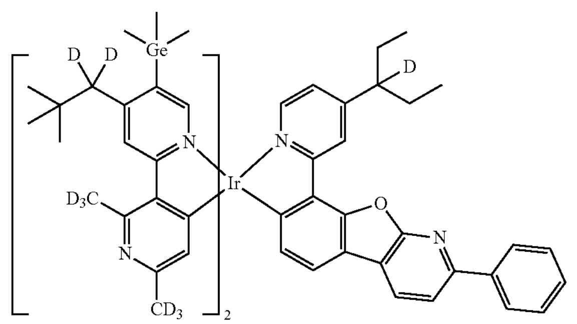
1492
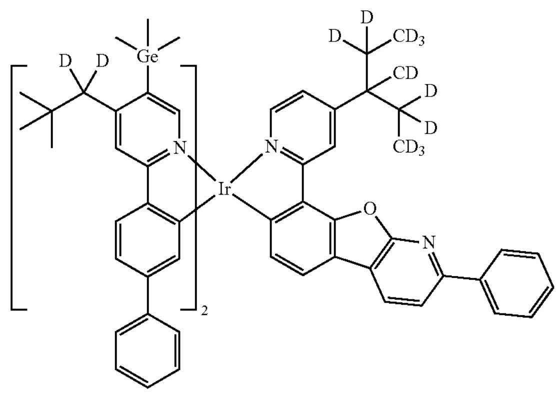
1493
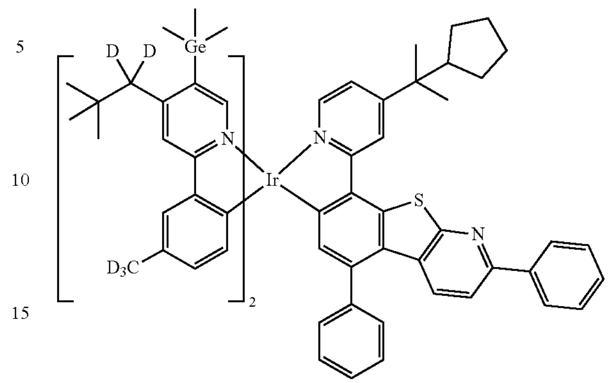
1494
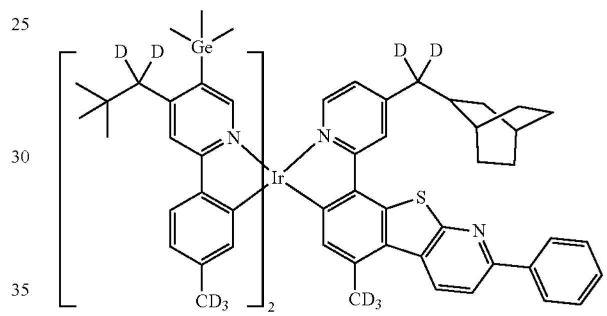
1495
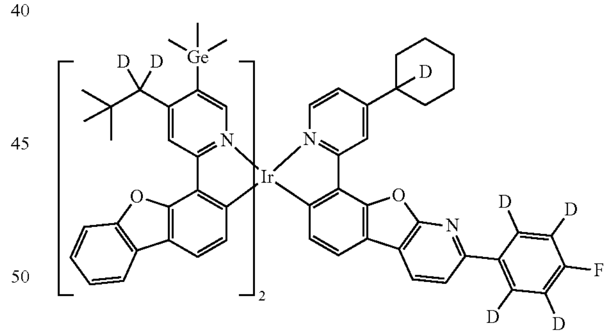
1496
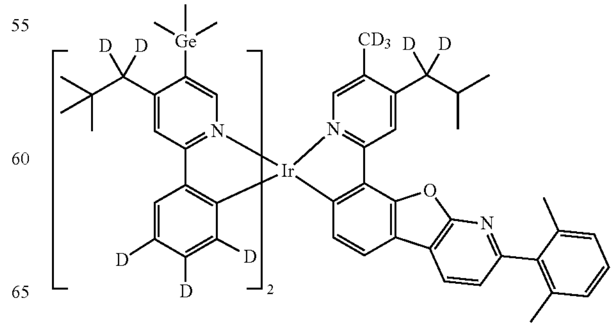

-continued
1497
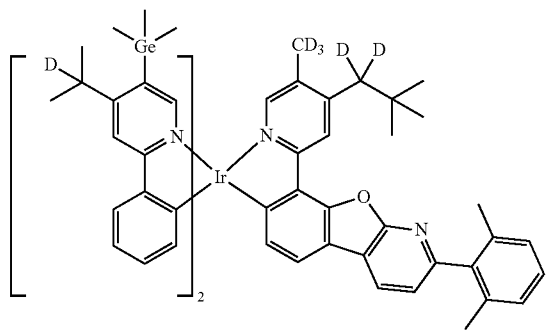
1498
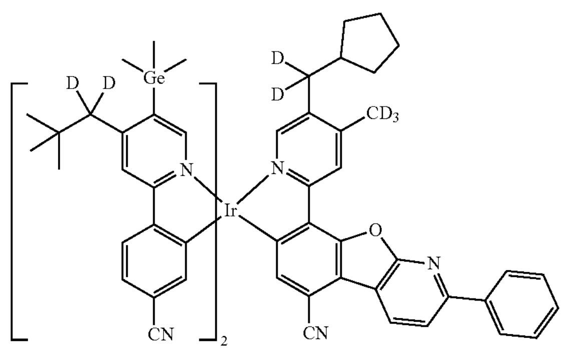
1499
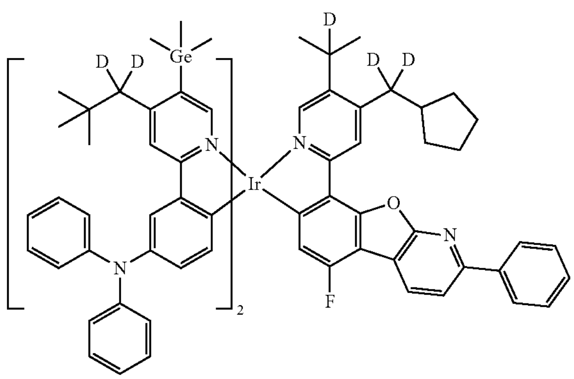
1500
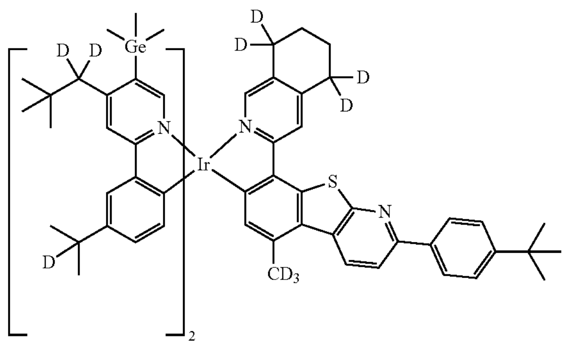
-continued
1501
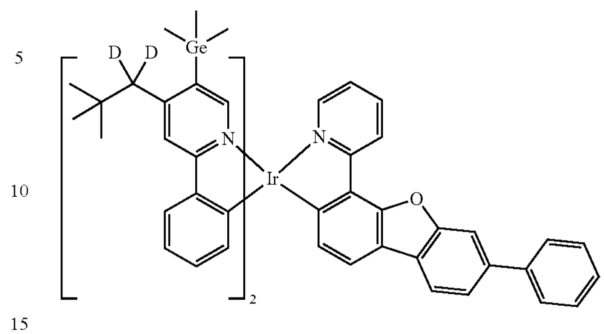
1502
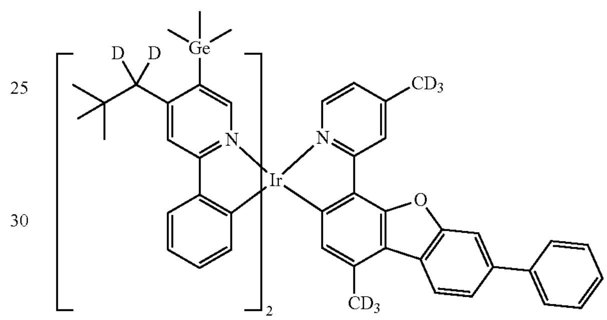
1503
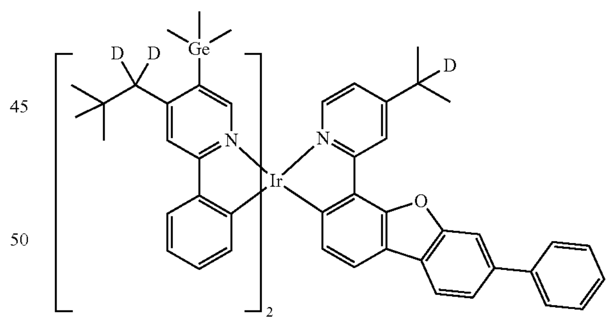
1504
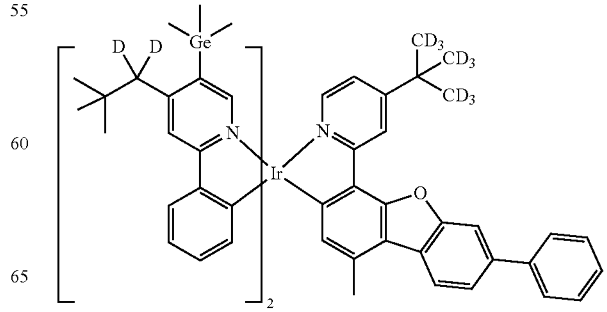

-continued
1505
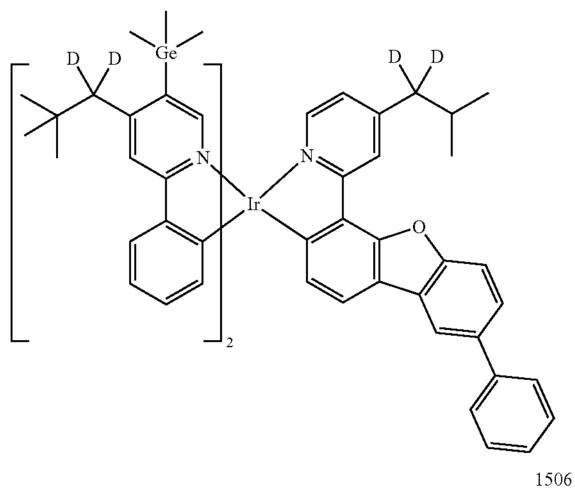
1506
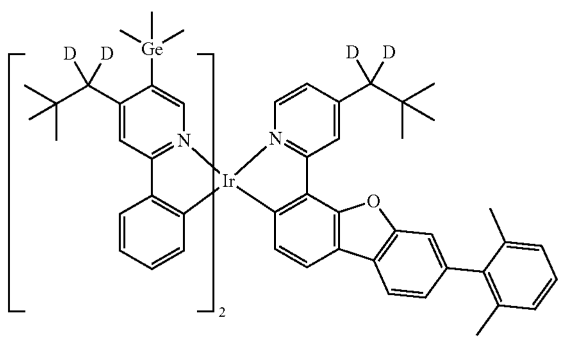
1507
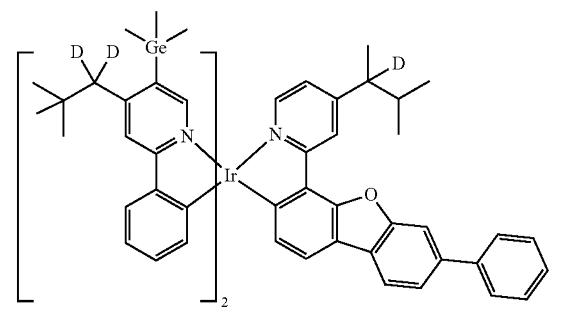
1508
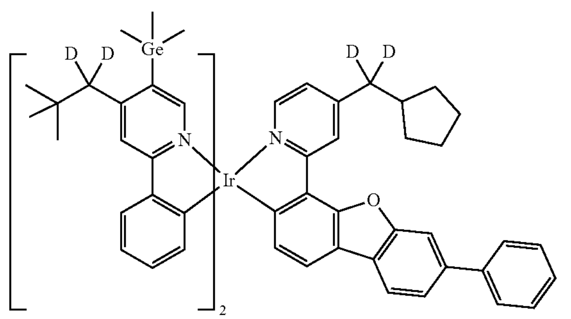
-continued
1509
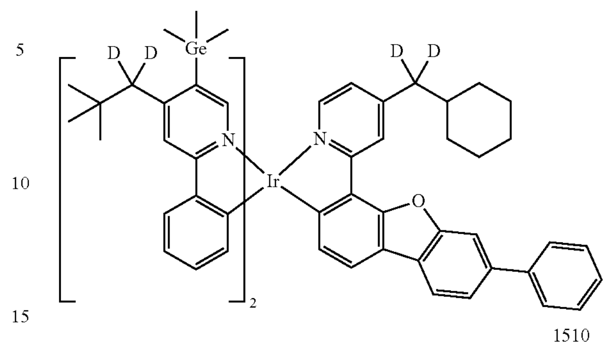
1510
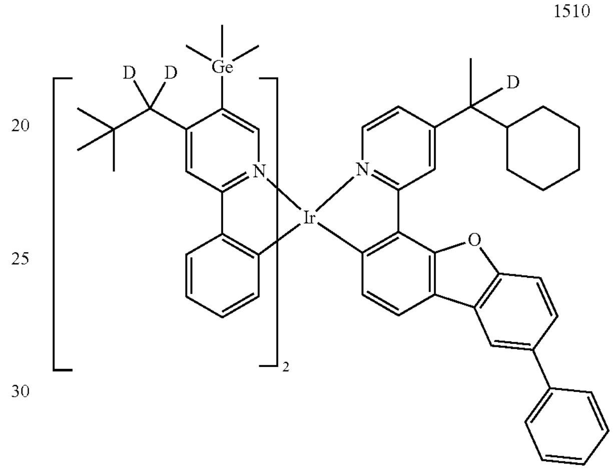
1511
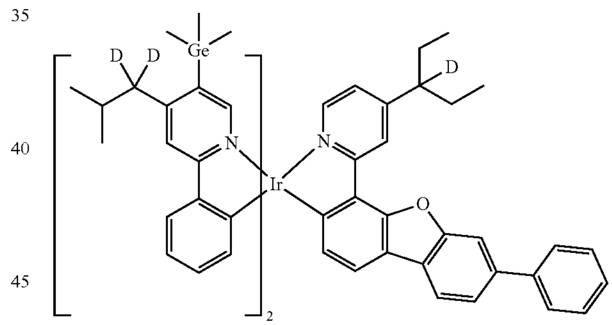
1512
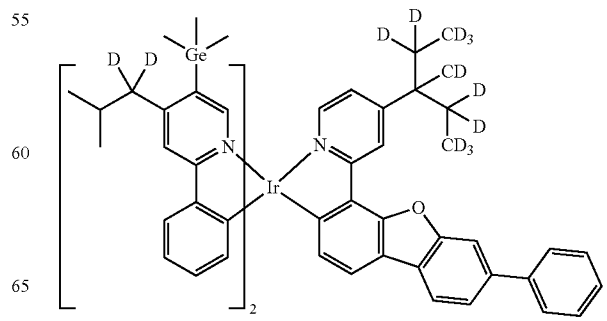

-continued
1513
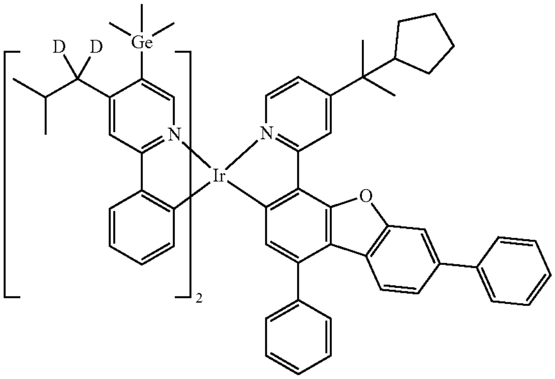
1514
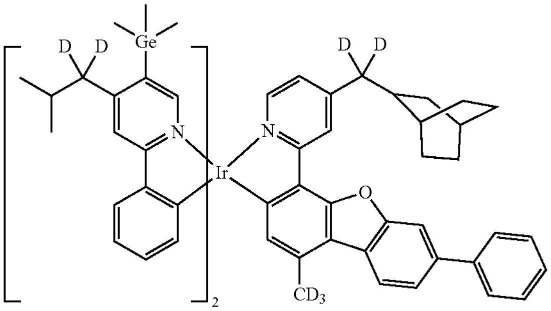
1515
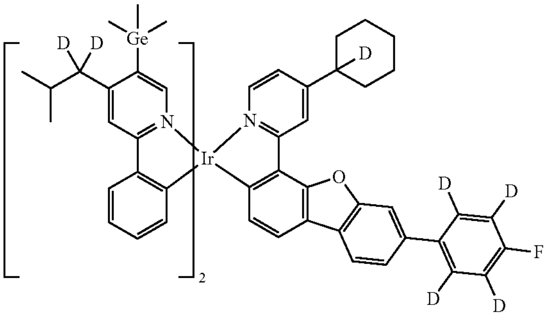
1516
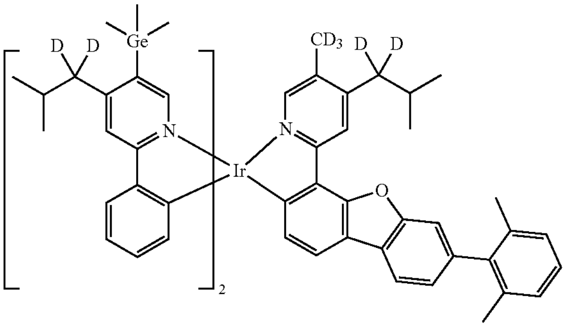
-continued
1517
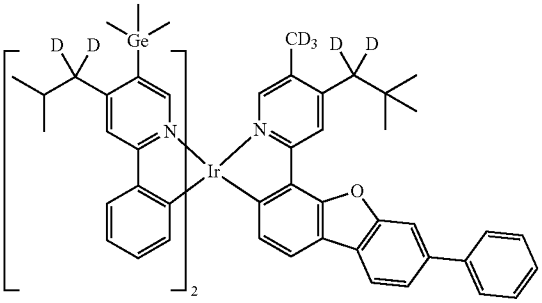
1518
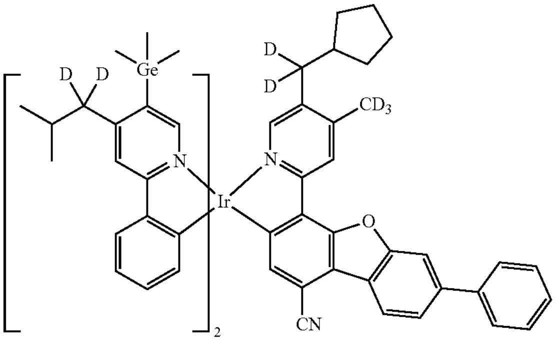
1519
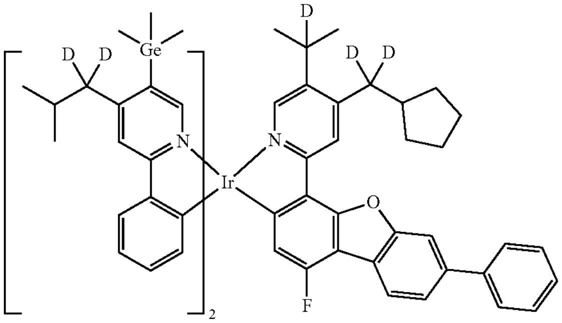
1520
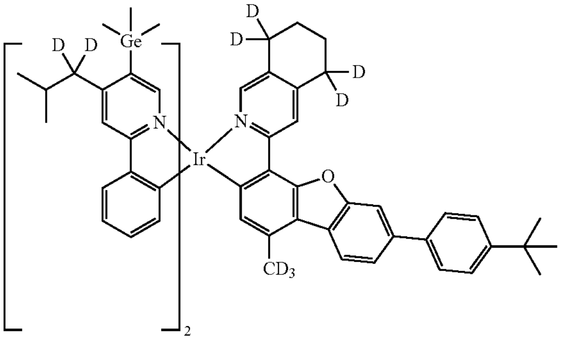

-continued
1521
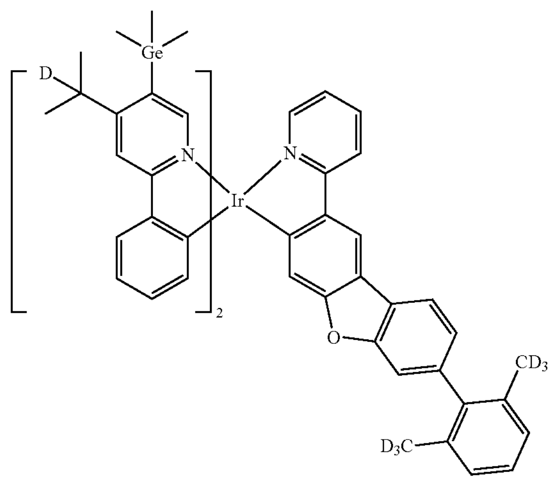
1522
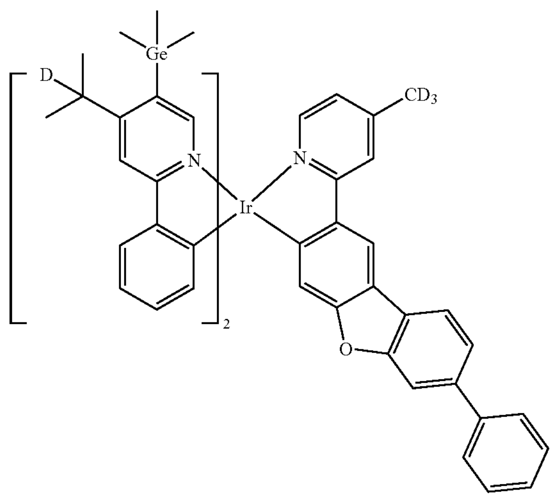
1523
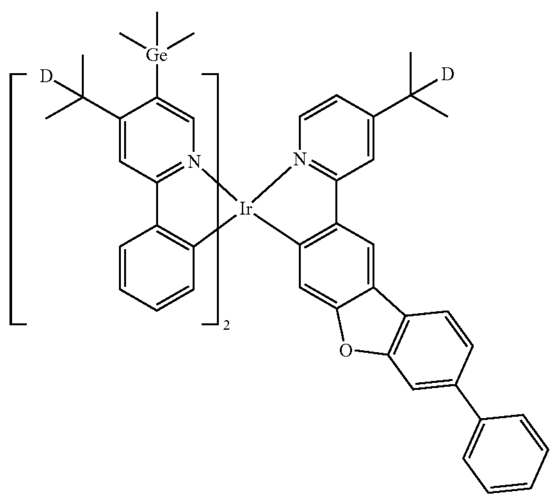
-continued
1524
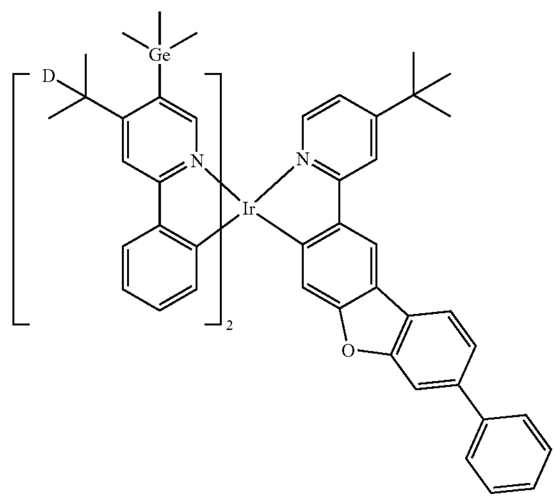
1525
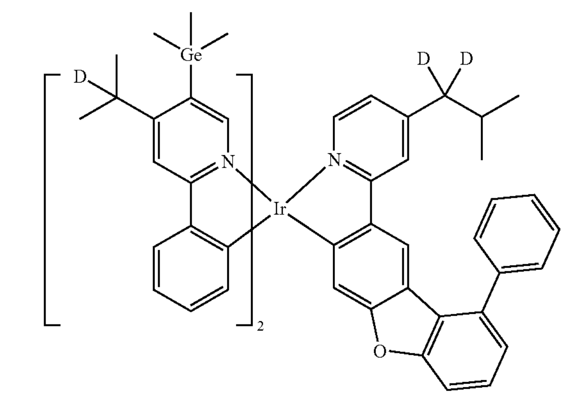
1526
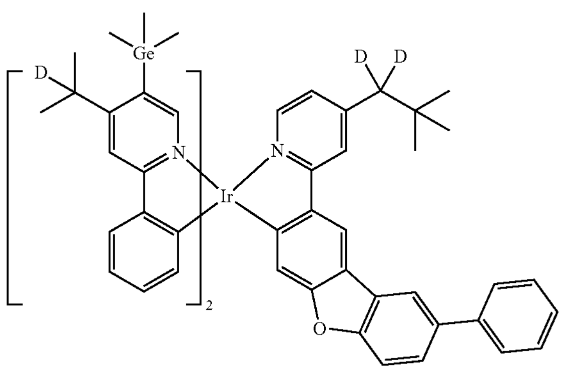

1527
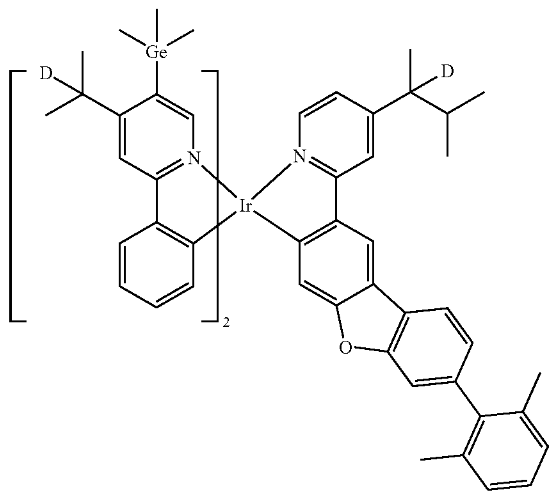
1528
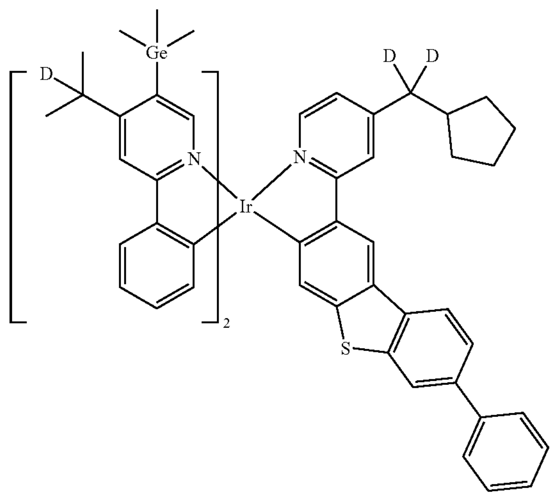
1529
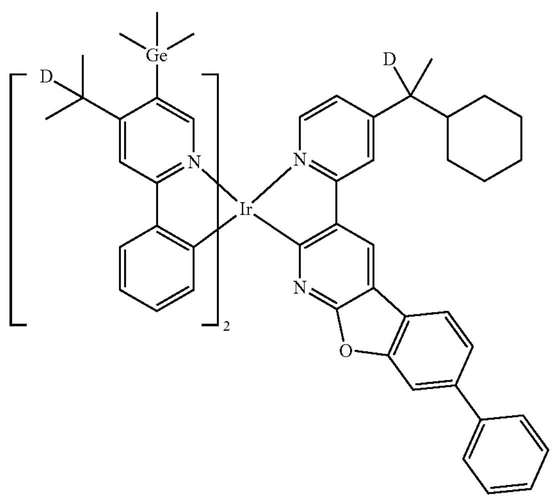
1530
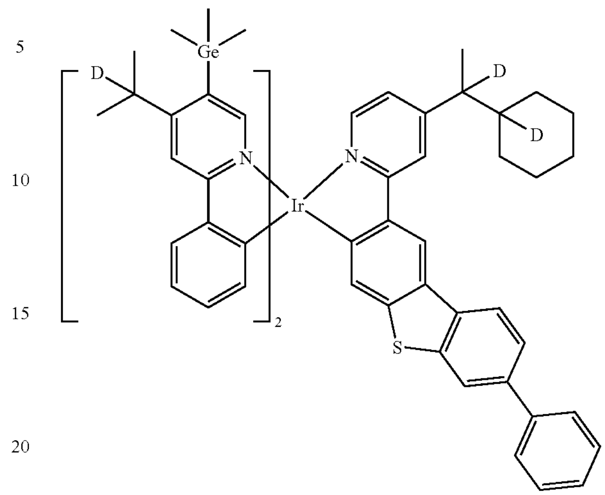
1531
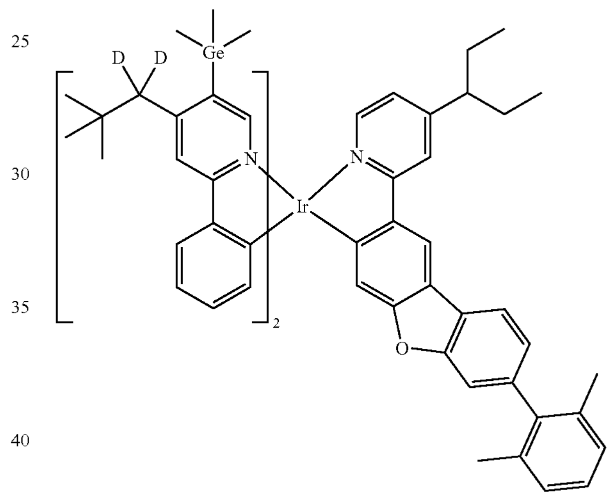
1532
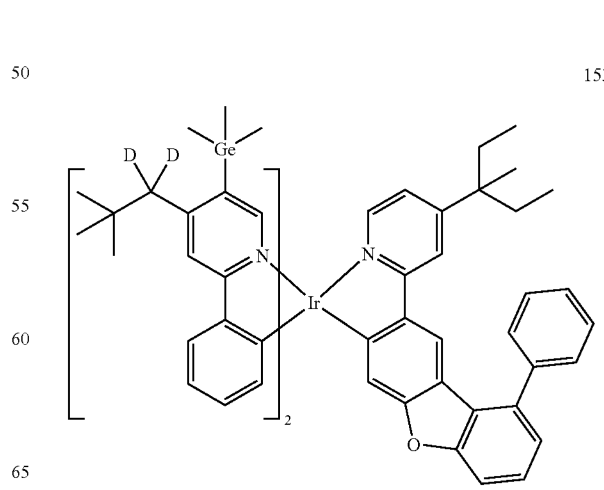

-continued
1533
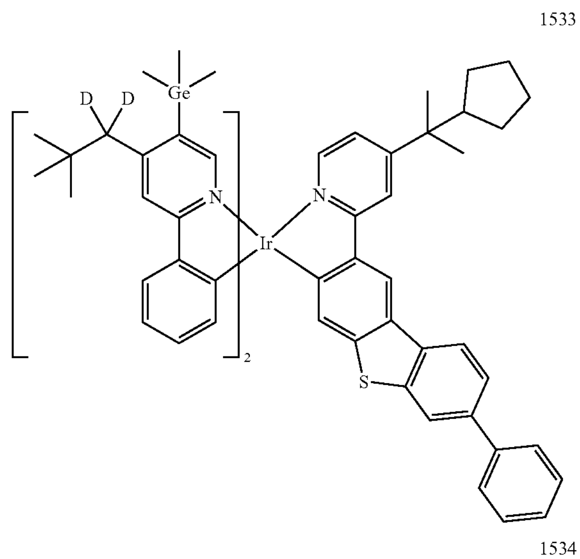
1534
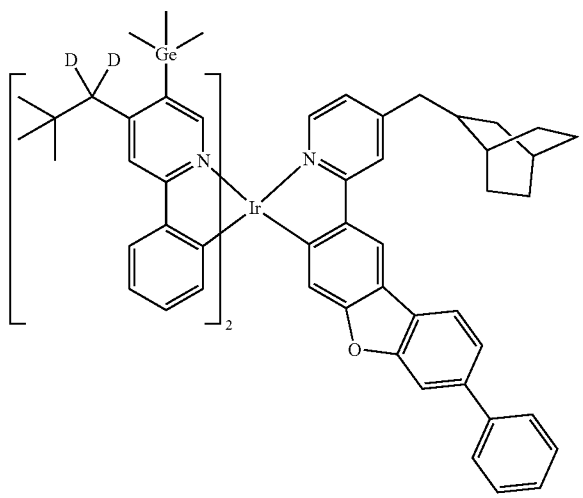
1535
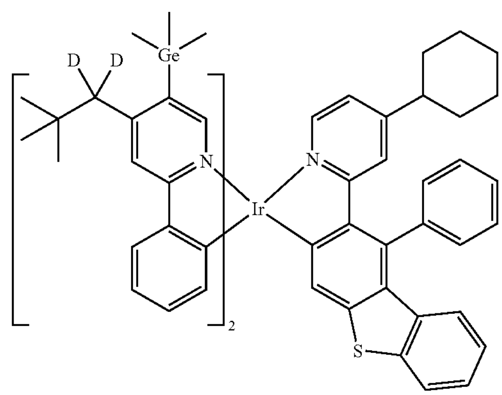
-continued
1536
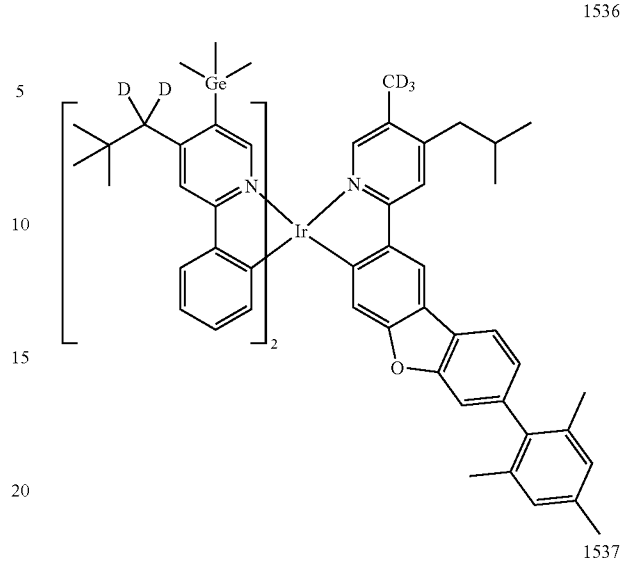
1537
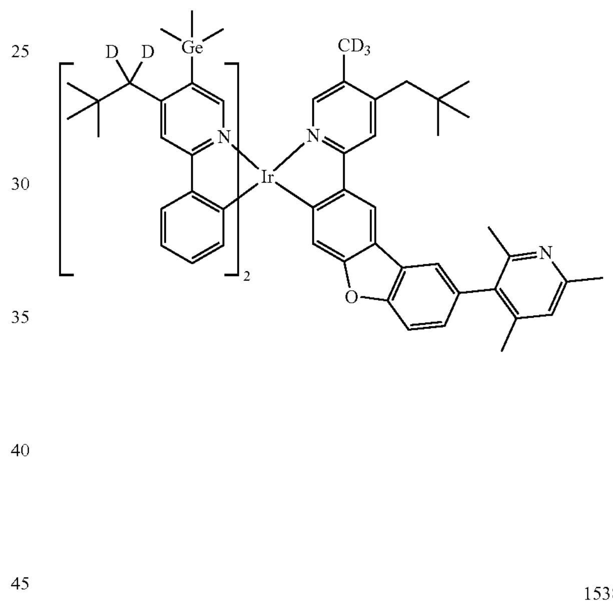
1538
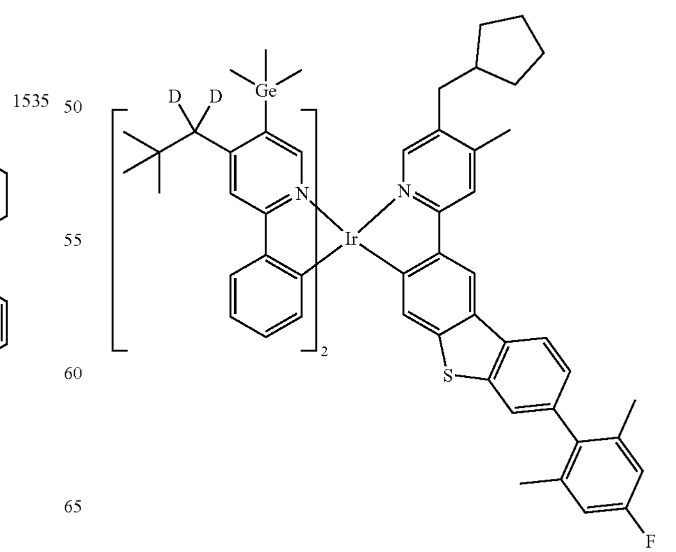

-continued
1539
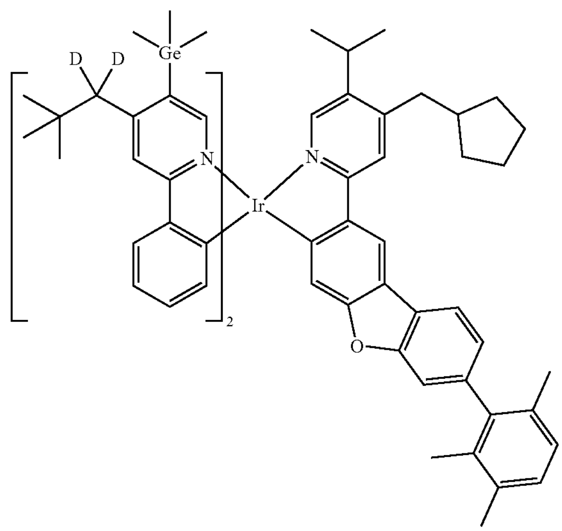
1540
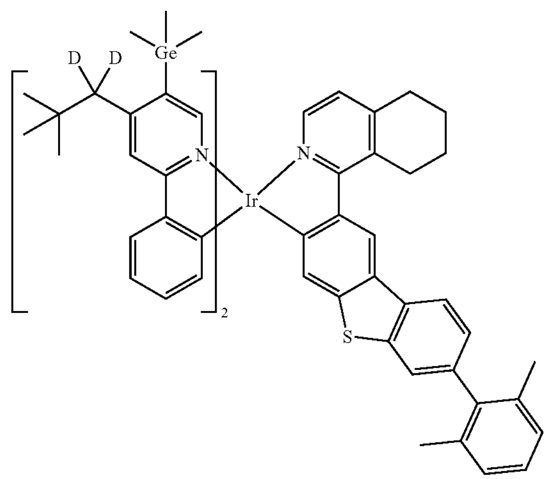
1541
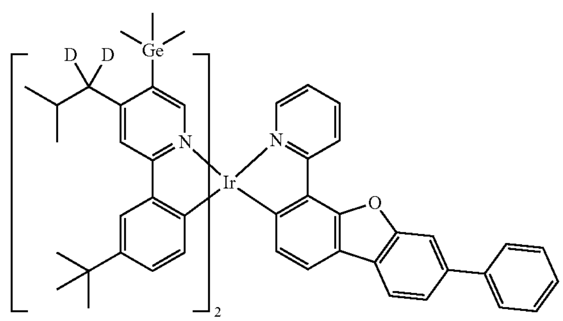
-continued
1542
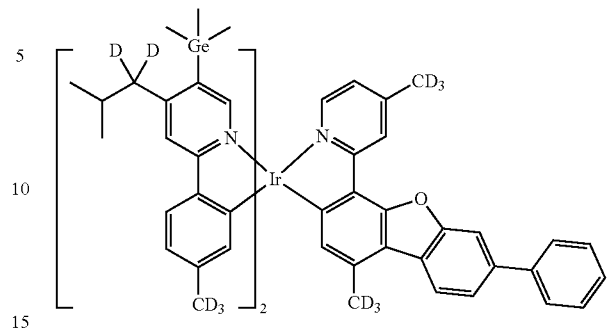
1543
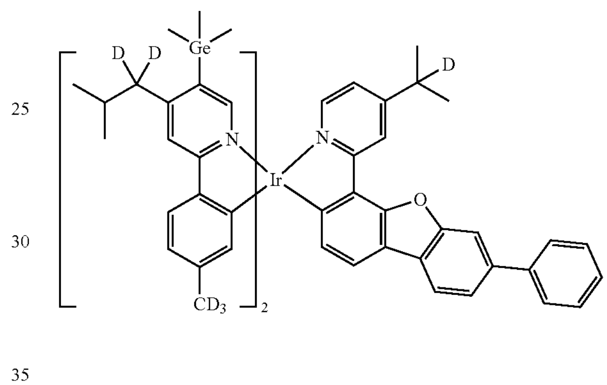
1544
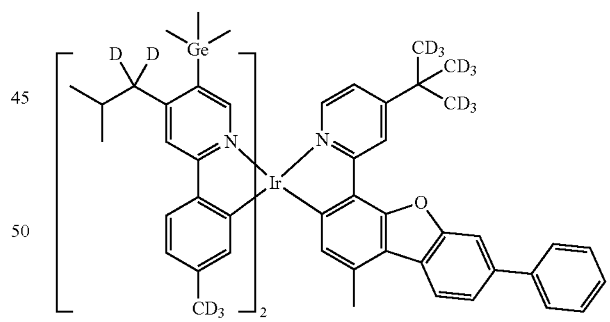
1545
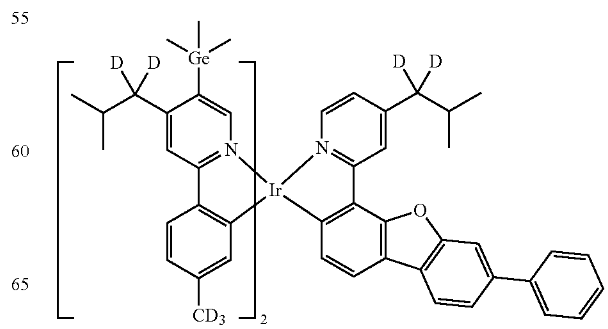

-continued
1546
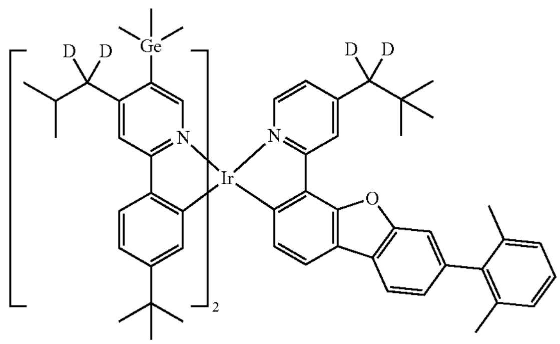
1547
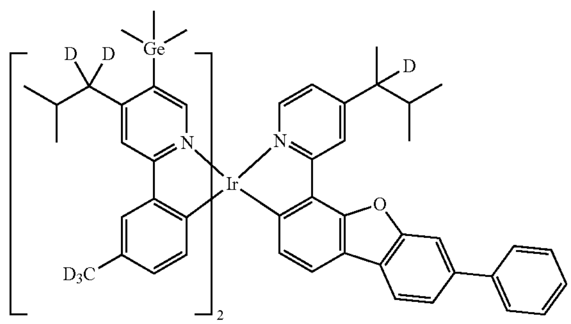
1548
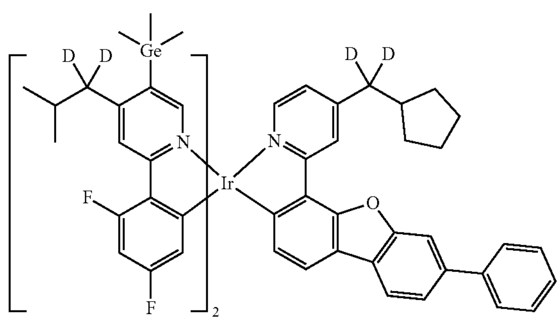
1549
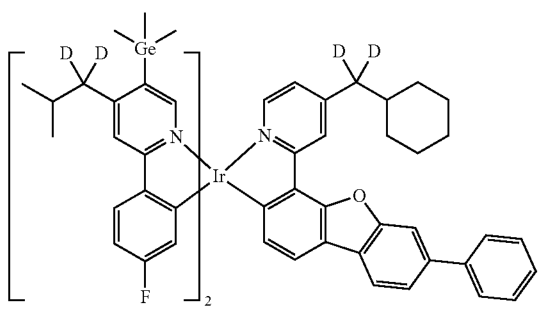
-continued
1550
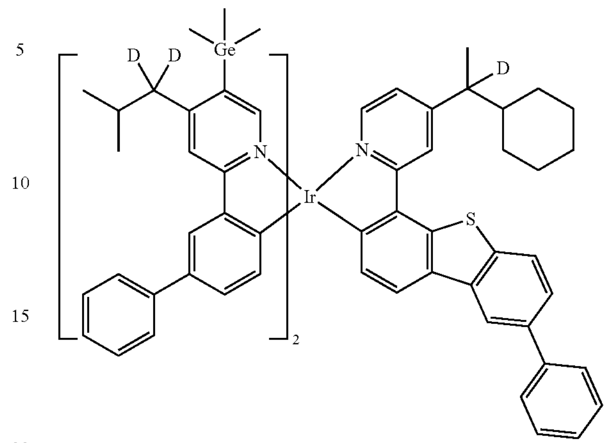
1551
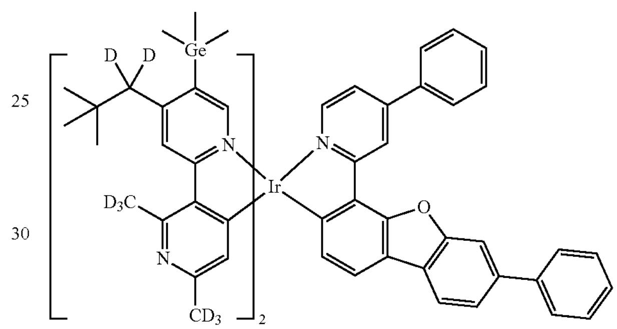
1552
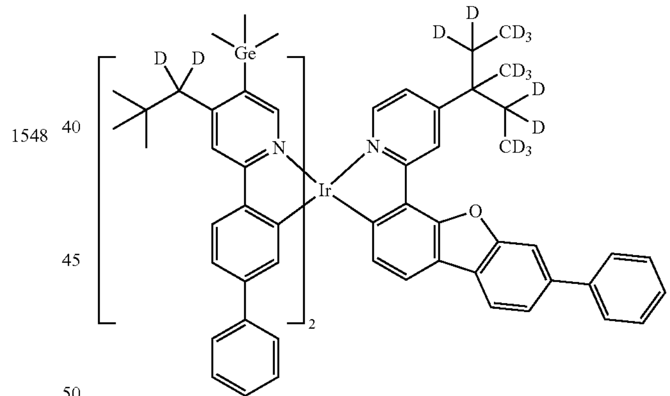
1553
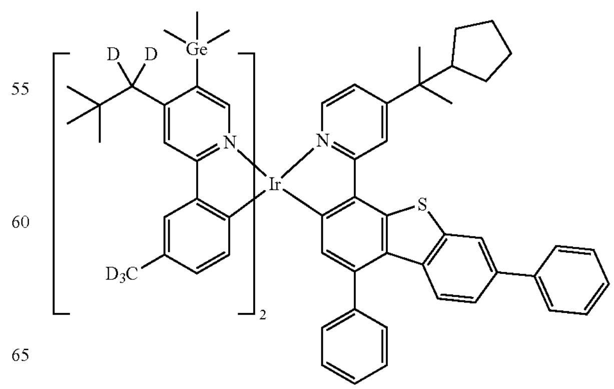

1554
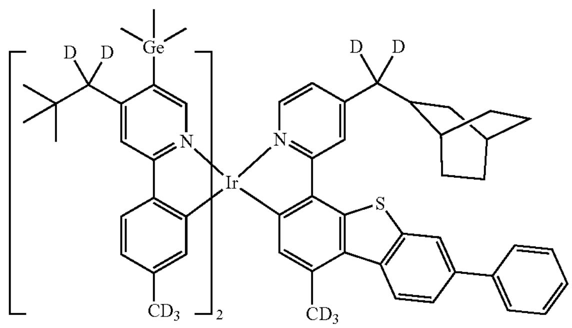
1555
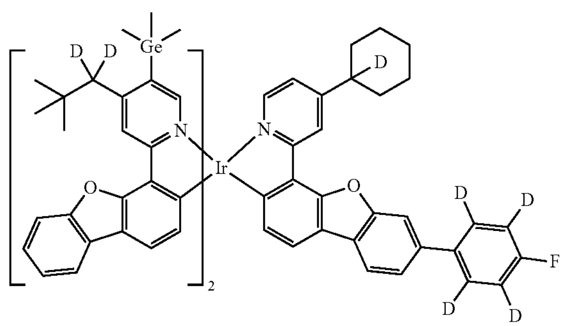
1556
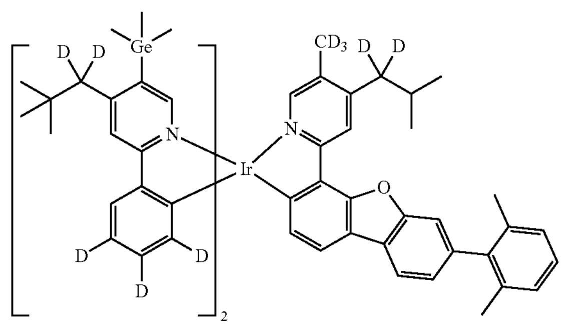
1557
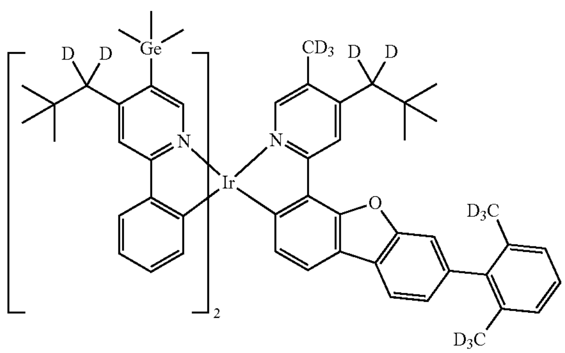
1558
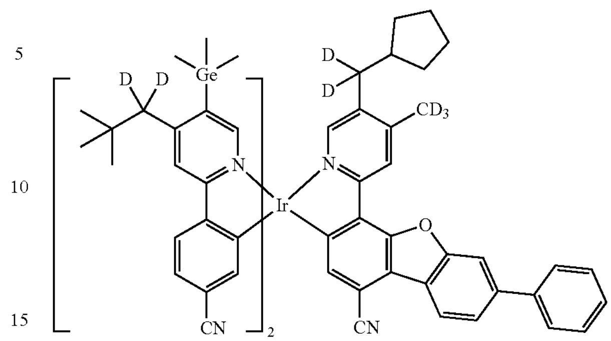
1559
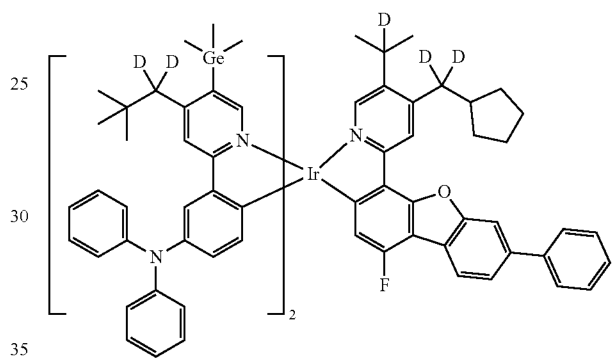
1560
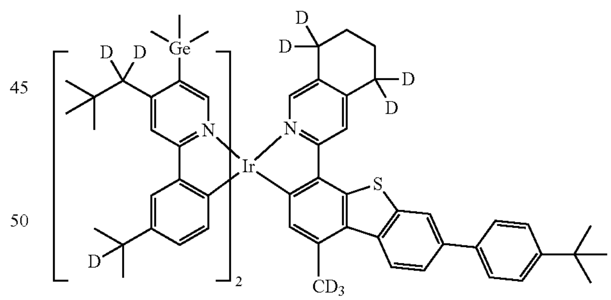
1561
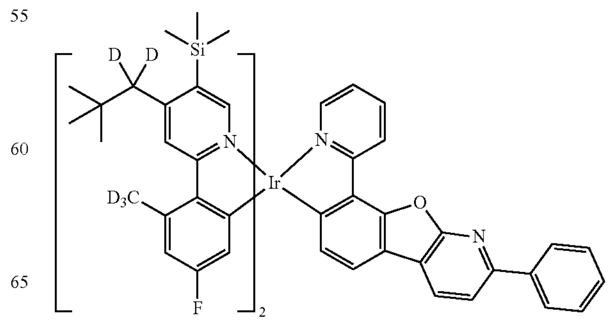

1562
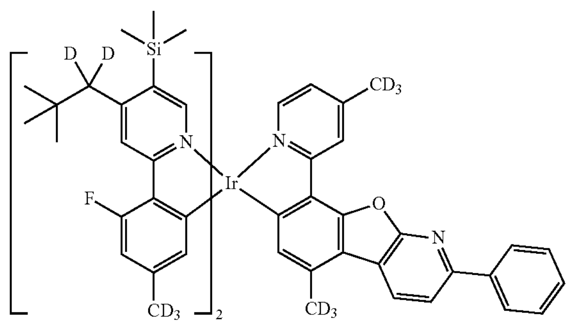
1563
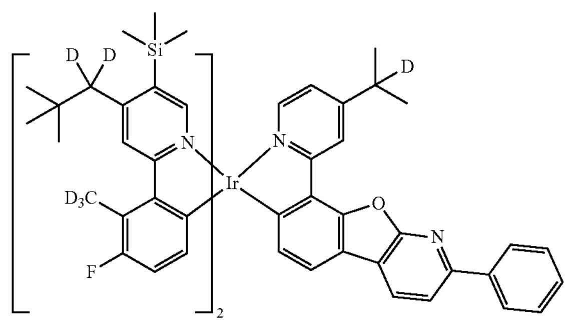
1564
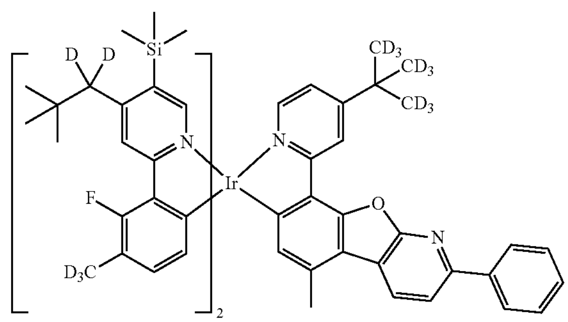
1565
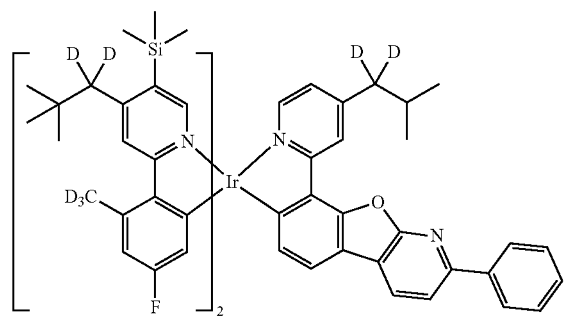
1566
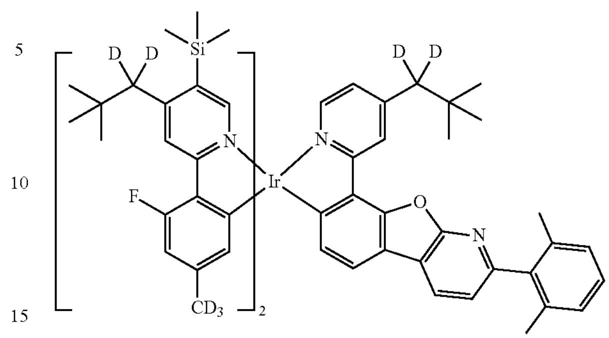
1567
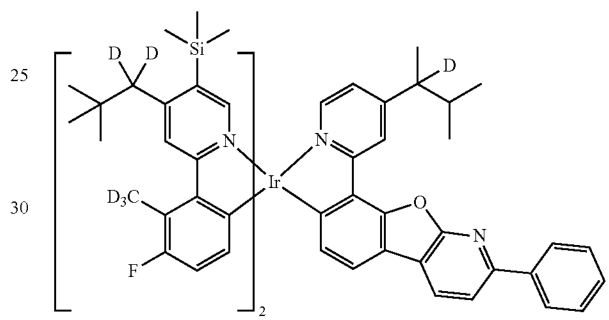
1568
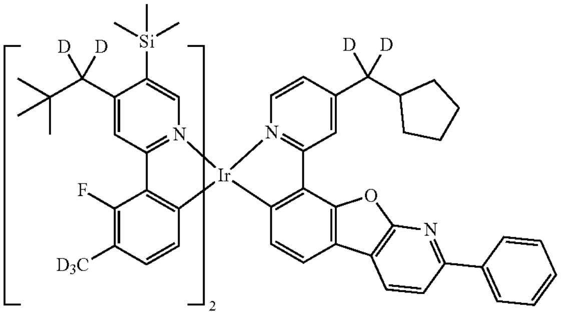
1569
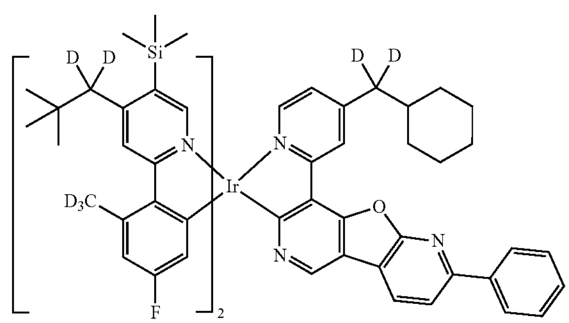

-continued
1570
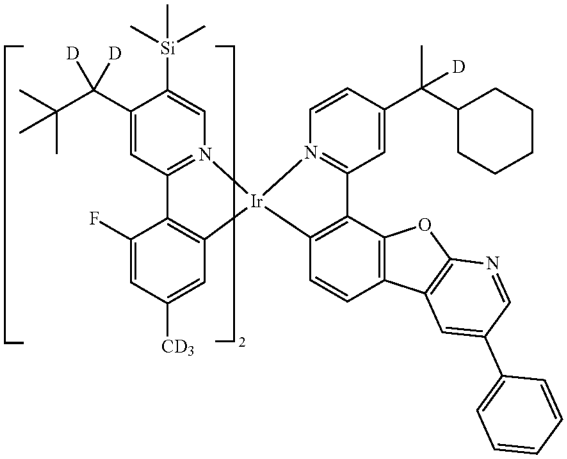
1571
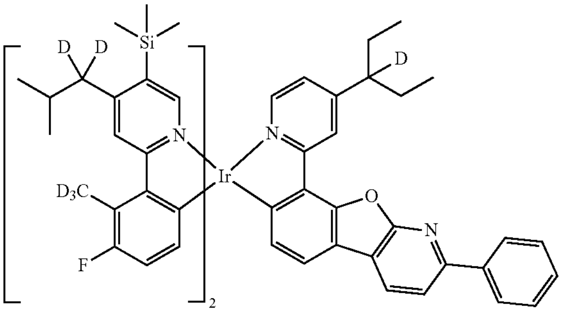
1572
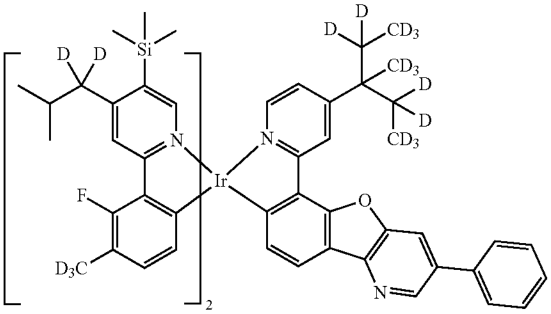
1573
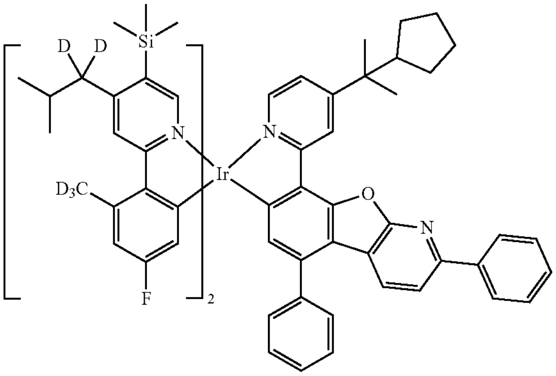
-continued
1574
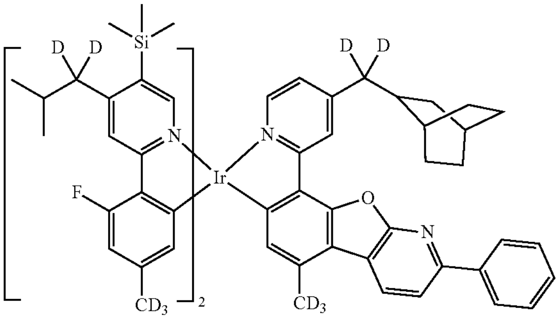
1575
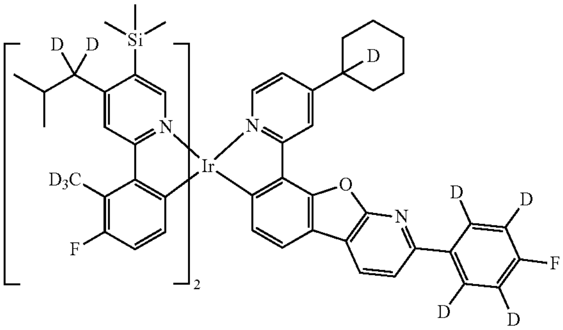
1576
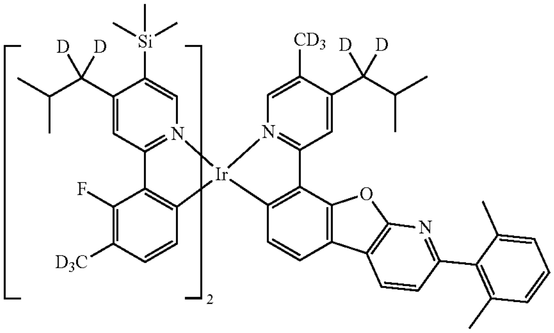
1577
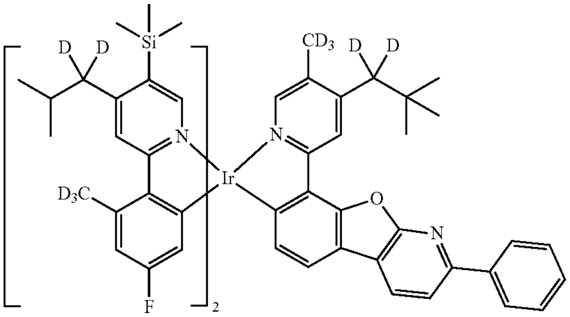

-continued
1578
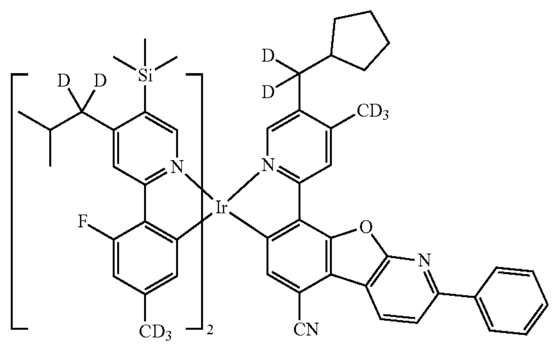
1579
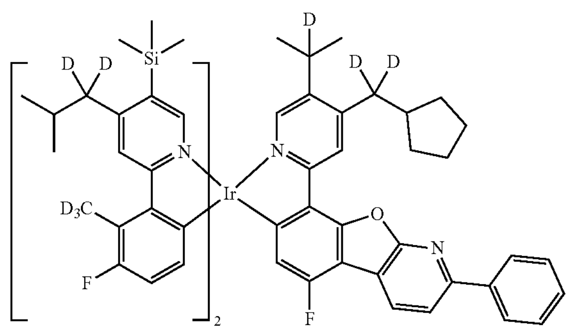
1580
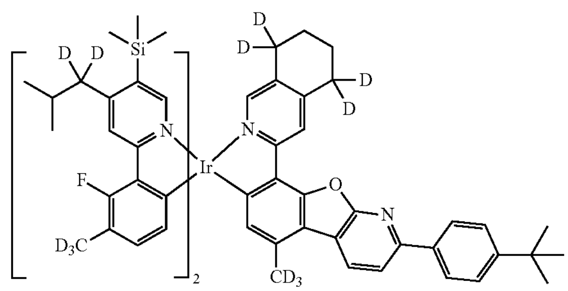
1581
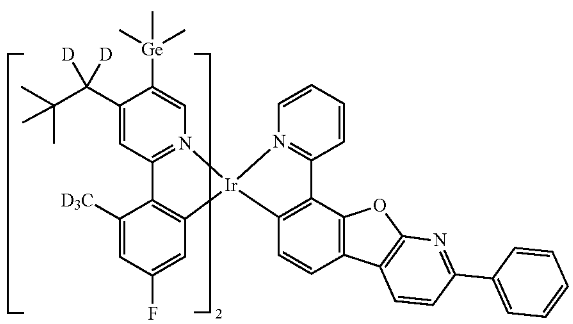
-continued
1582
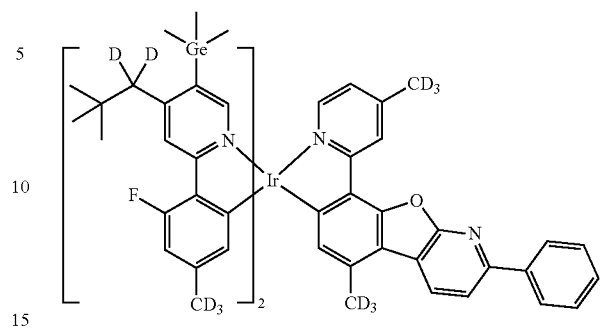
1583
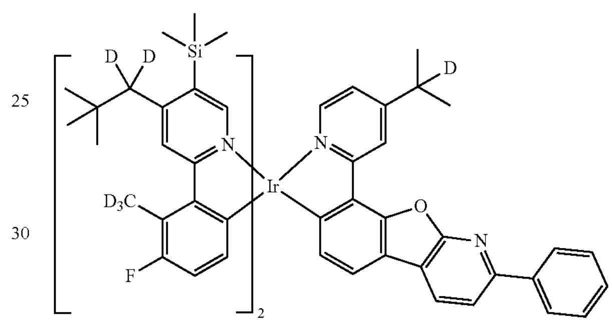
1584
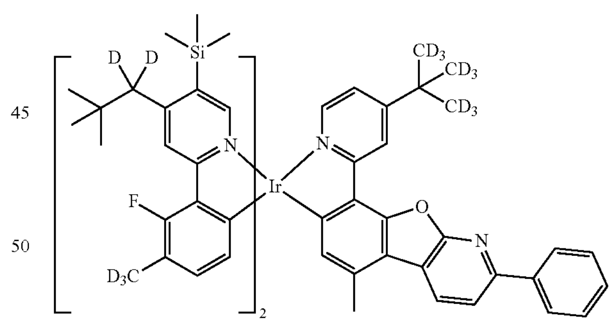
1585
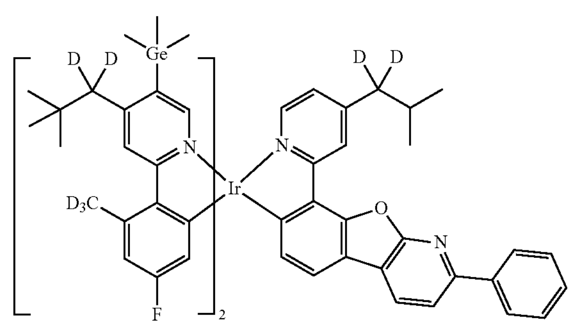

1586
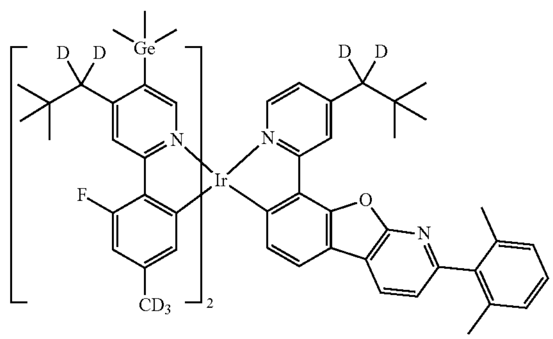
1587
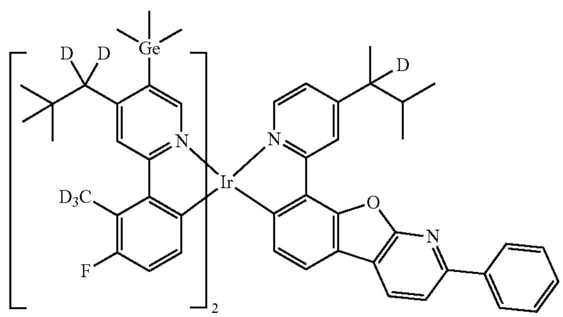
1588
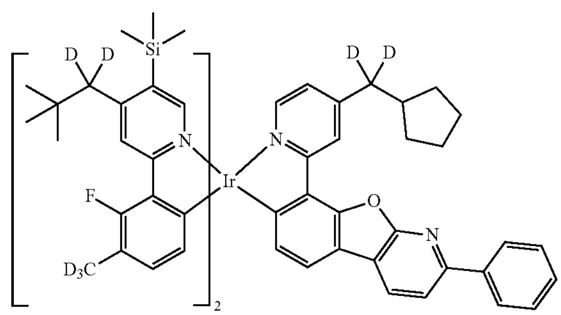
1589
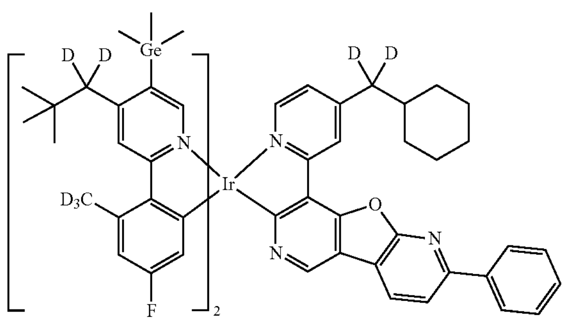
1590
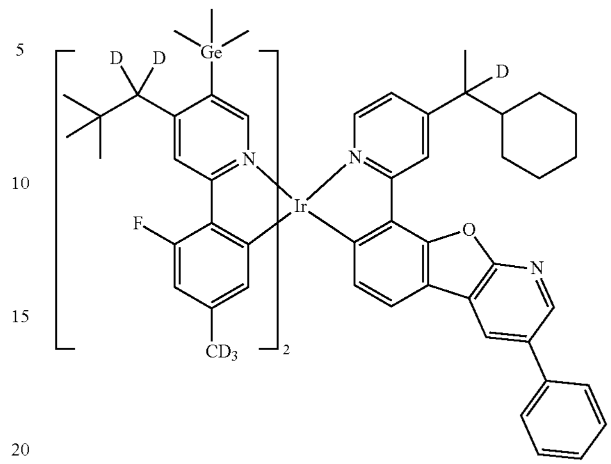
1591
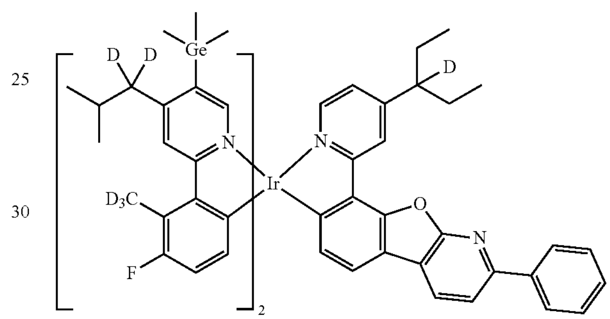
1592
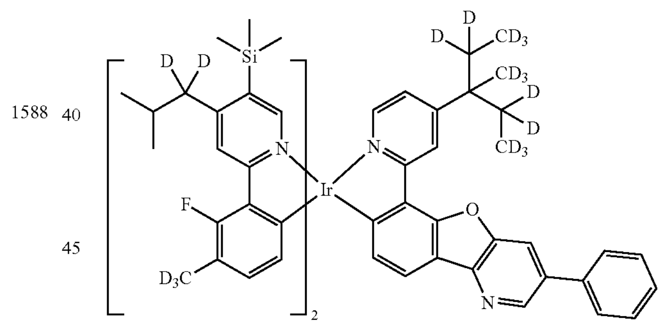
1593
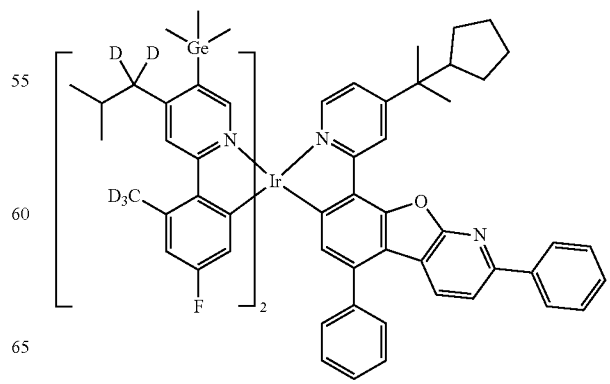

-continued
1594
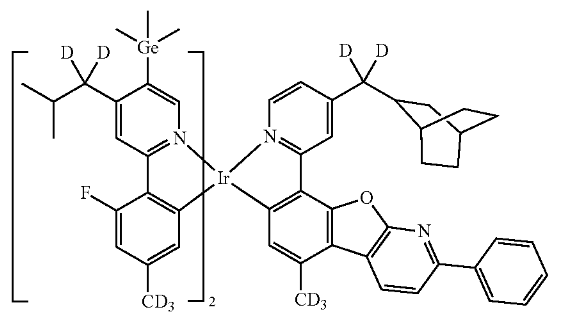
1595
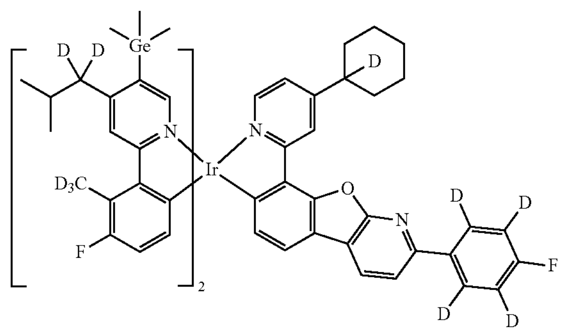
1596
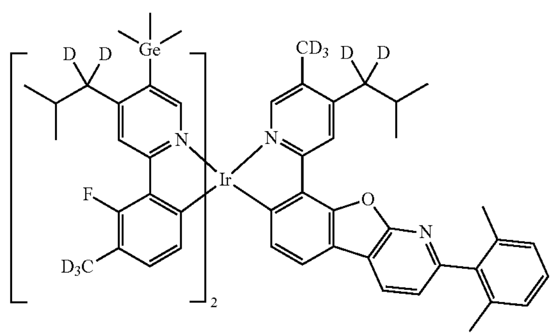
1597
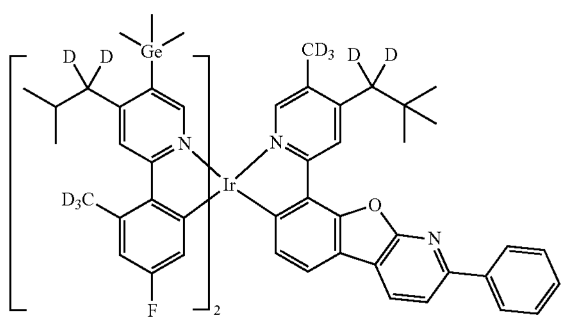
-continued
1598
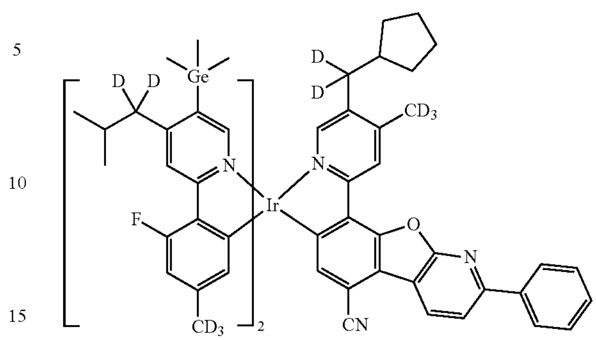
1599
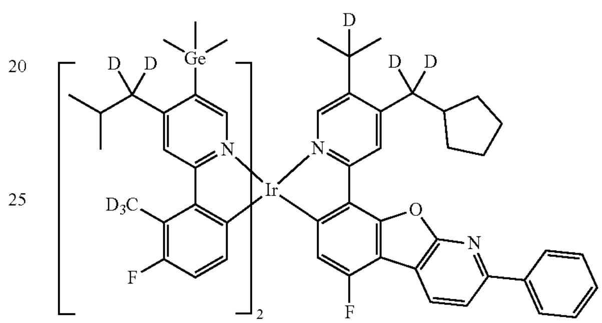
1600
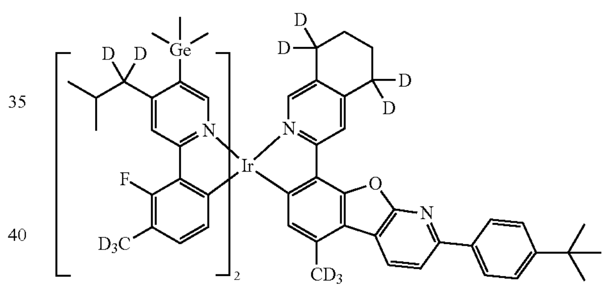
1601
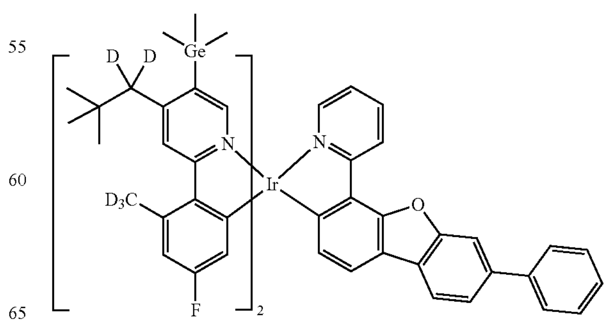

-continued
1602
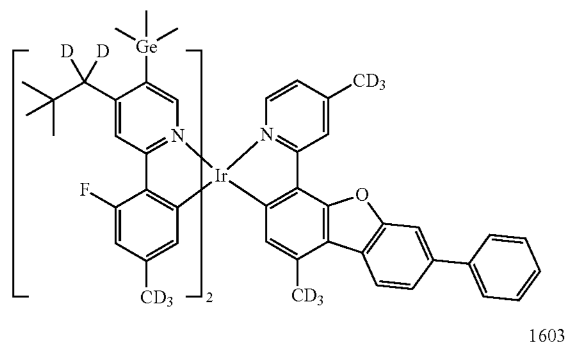
1603
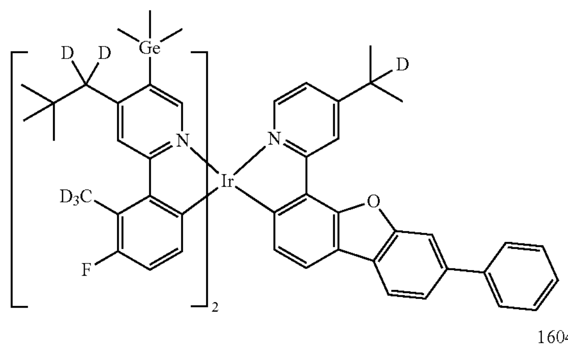
1604
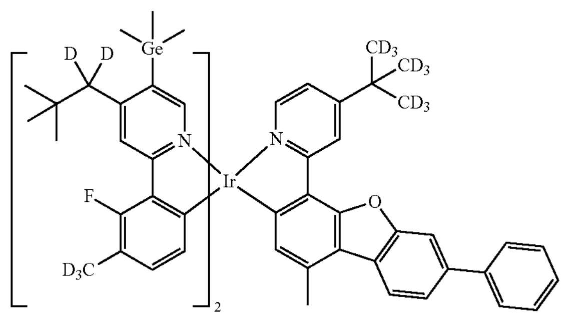
1605
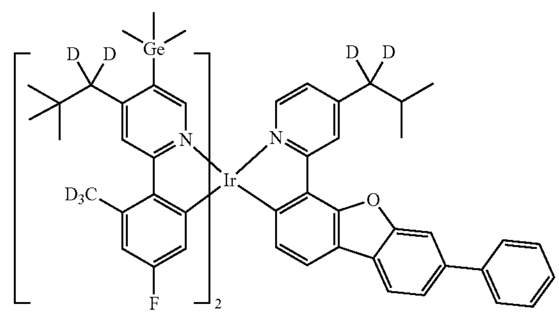
-continued
1606
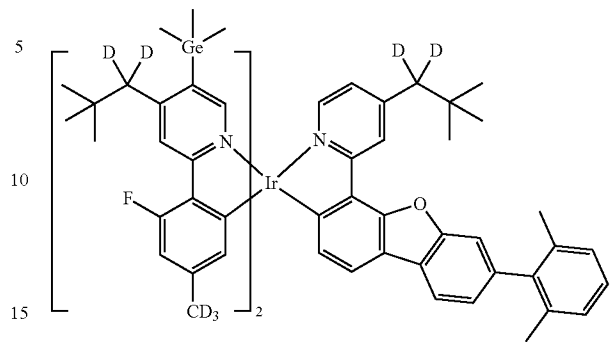
1607
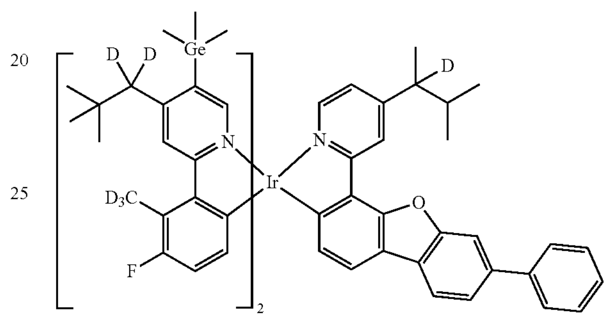
1608
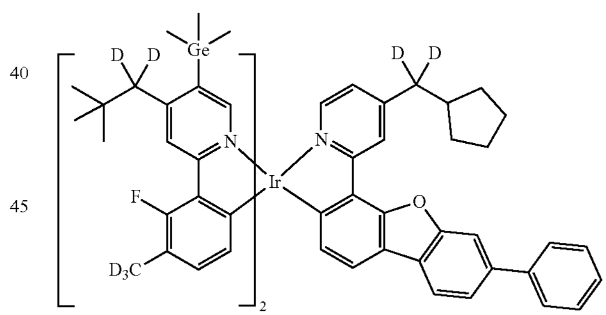
1609
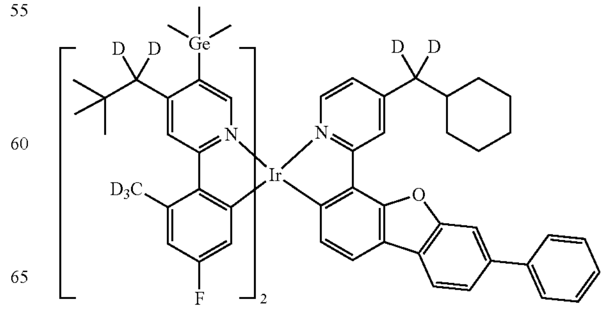

-continued
1610
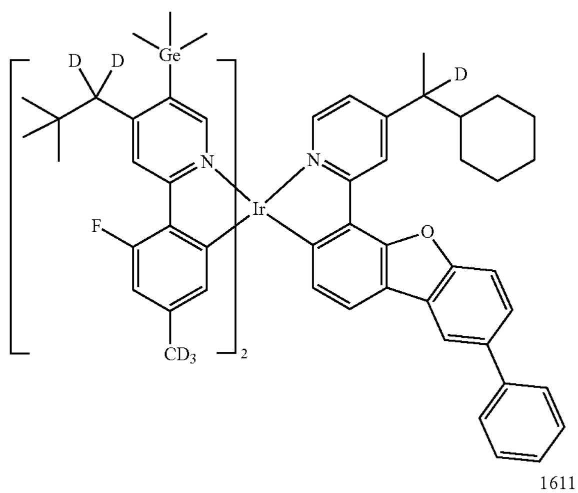
1611
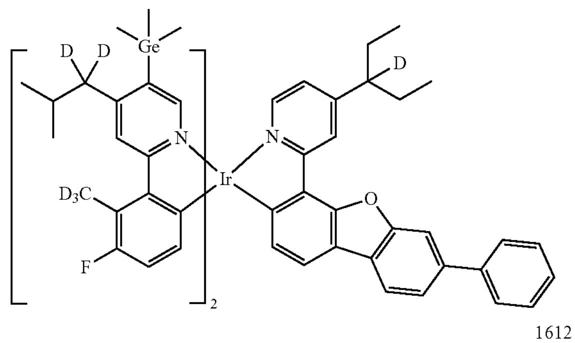
1612
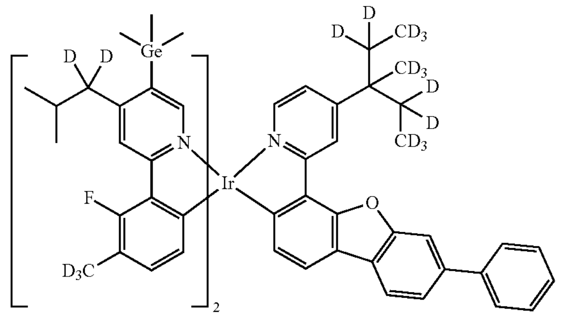
1613
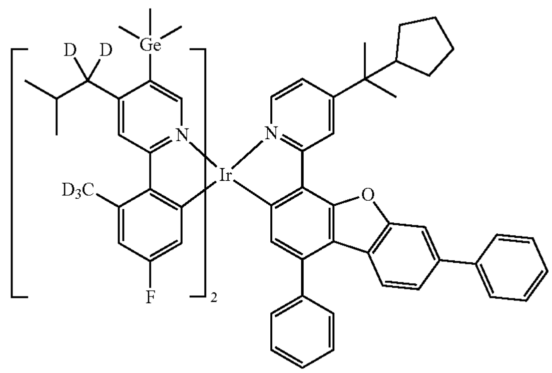
-continued
1614
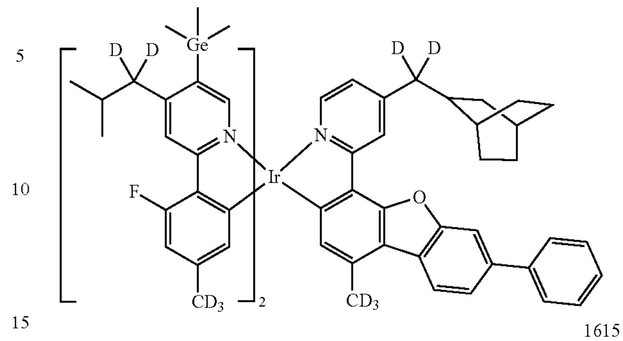
1615
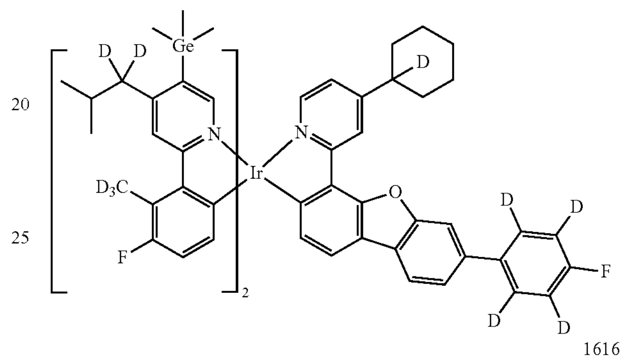
1616
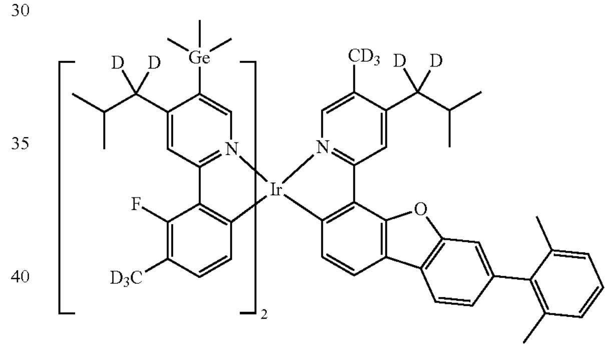
1617
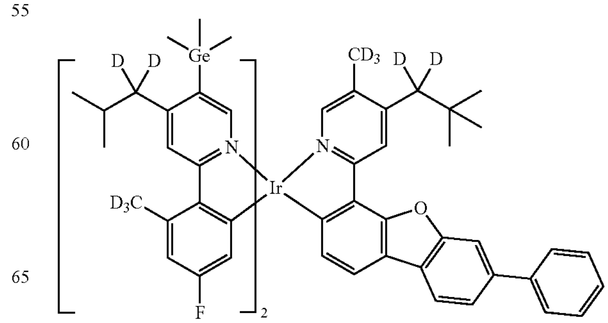

-continued
1618
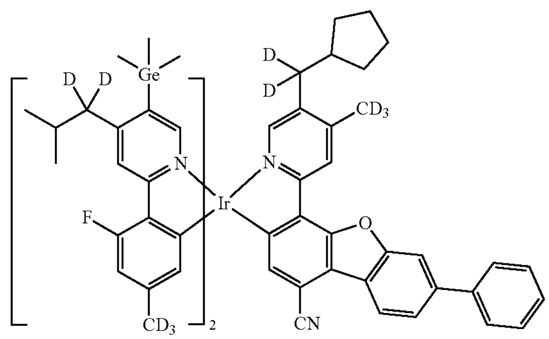
1619
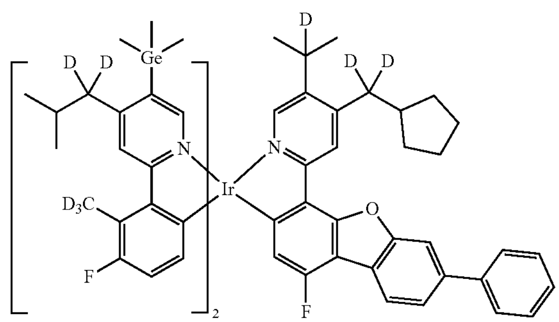
1620
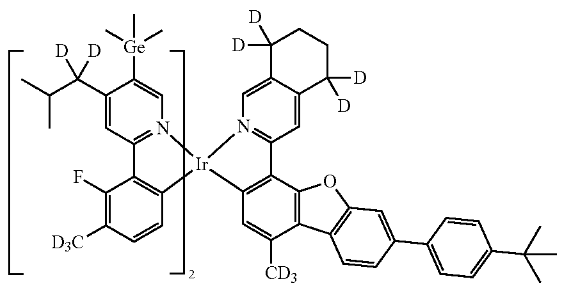
1621
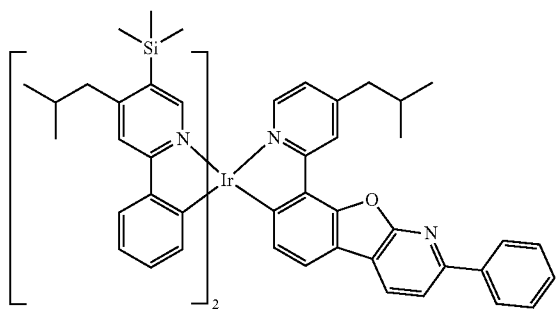
wherein "OMe" in Compounds 1 to 1621 in Group 1-1 represents a methoxy group.
Group 1-2
1
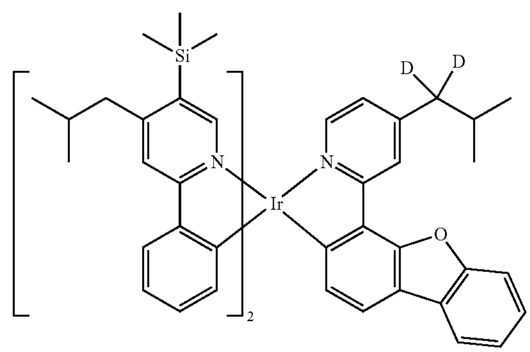
2
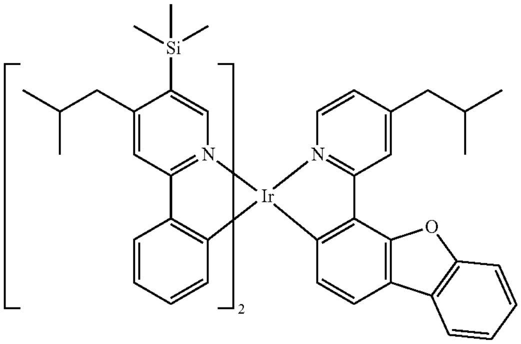
3
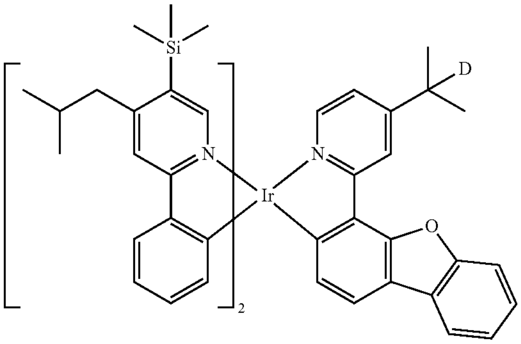
4
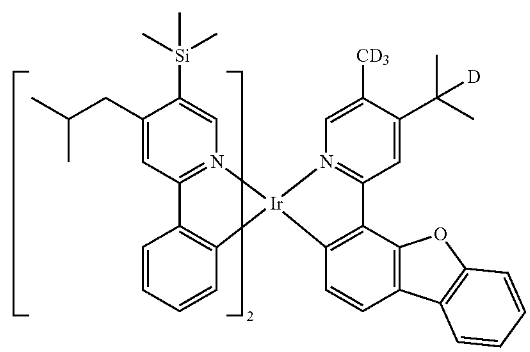

5
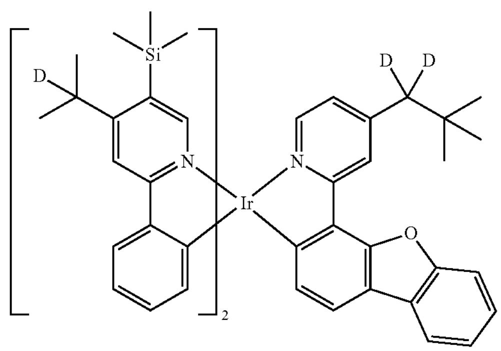
6
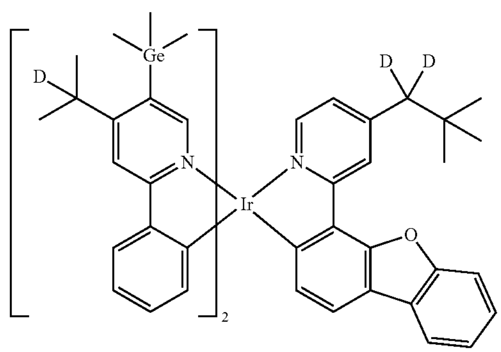
7
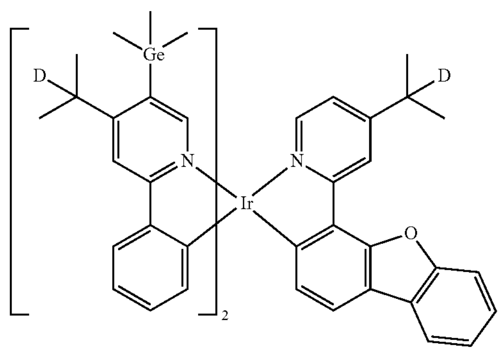
8
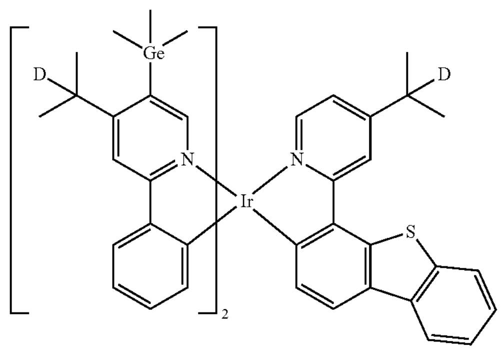
Group 1-3
1
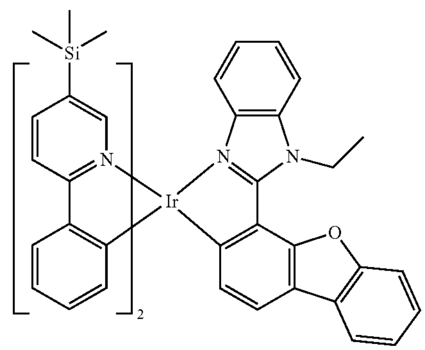
2
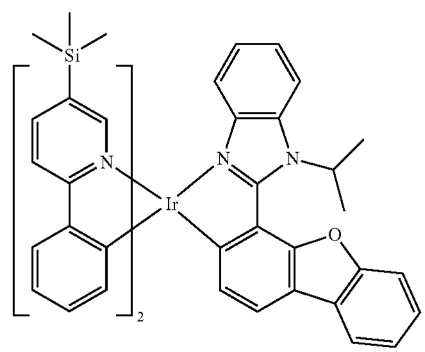
3
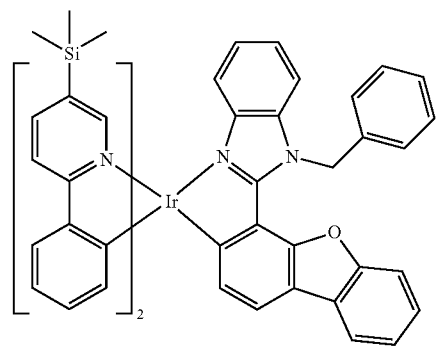
4
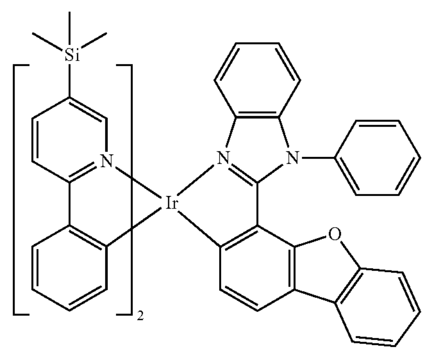

5
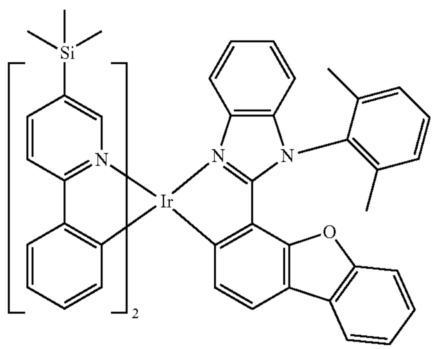
6
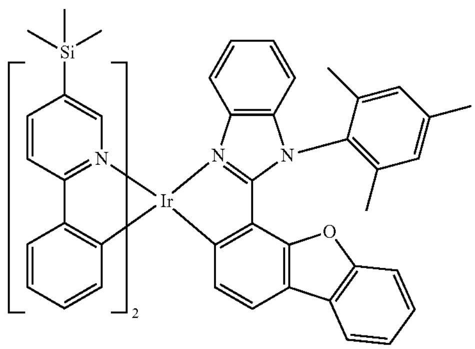
7
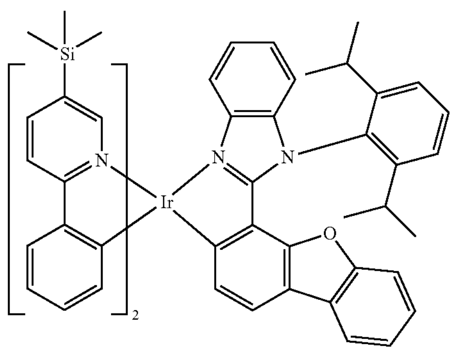
8
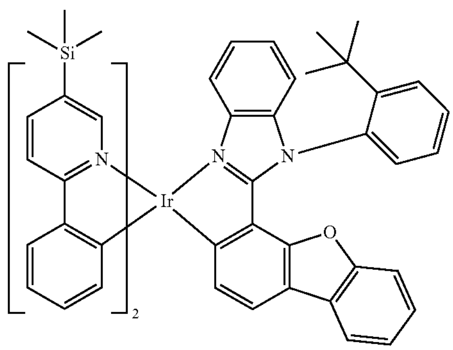
9
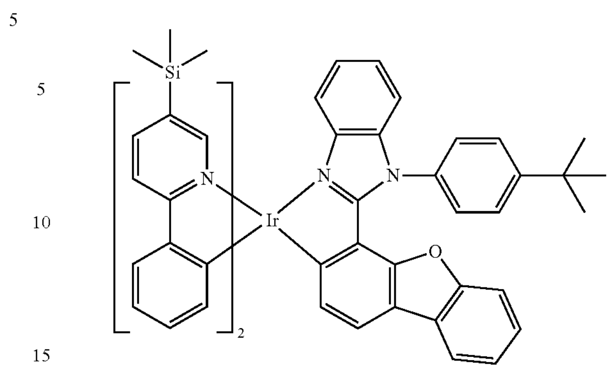
10
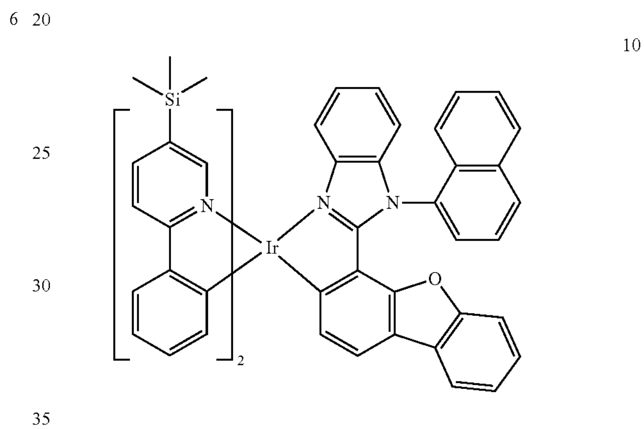
11
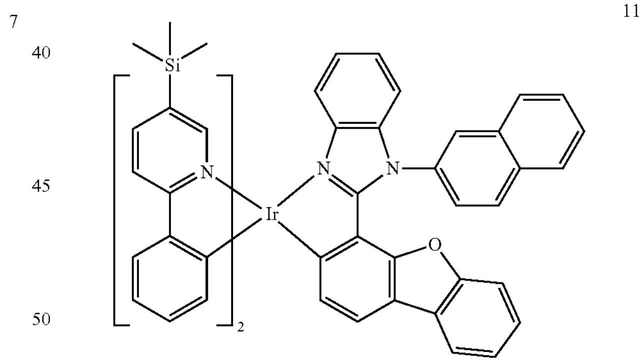
12
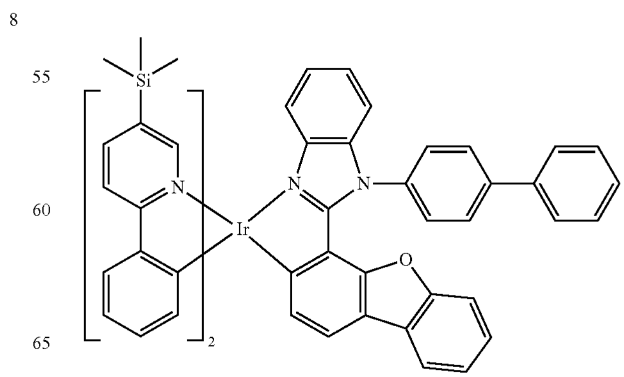

-continued
13
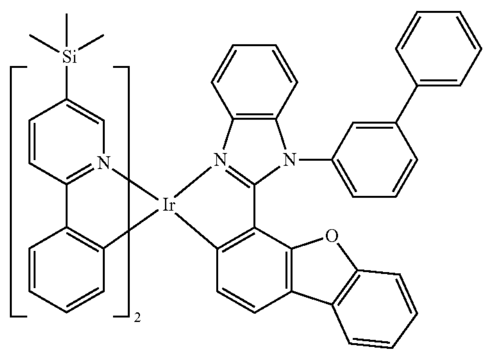
14
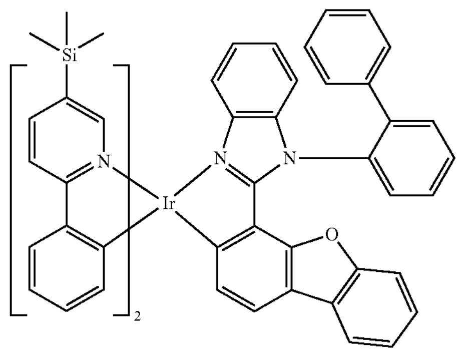
15
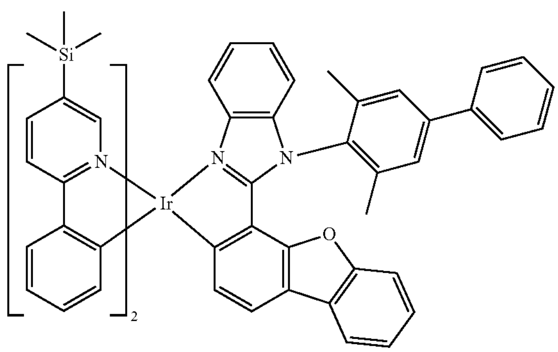
16
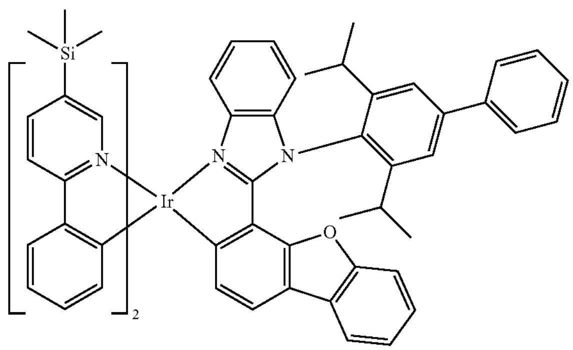
-continued
17
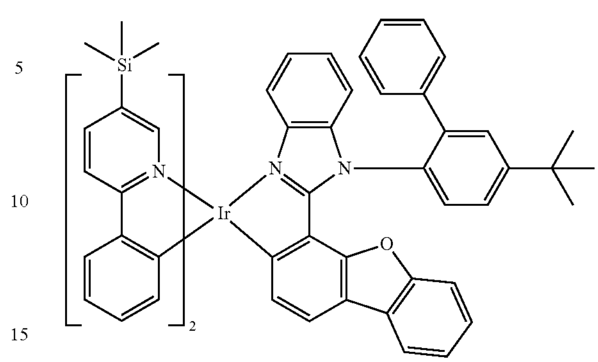
18
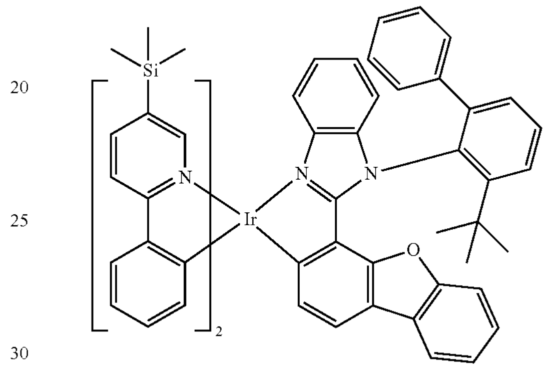
19
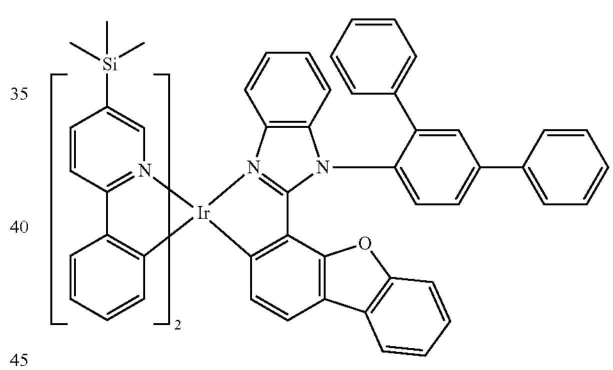
20
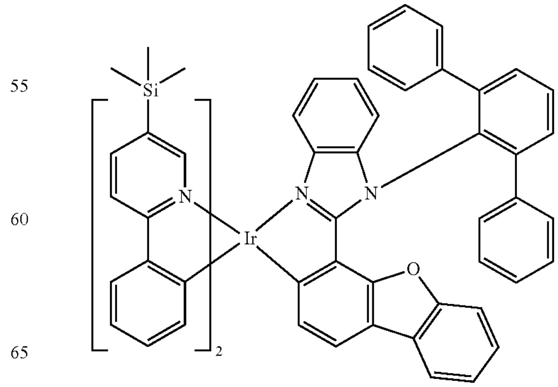

-continued
21
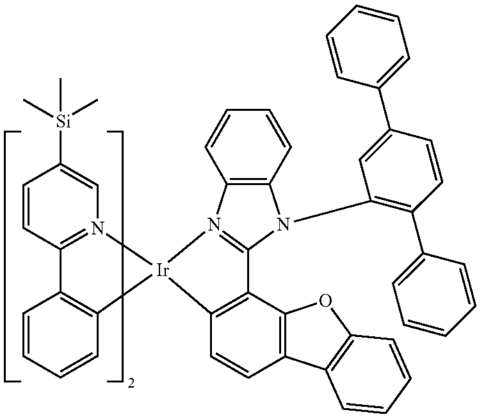
22
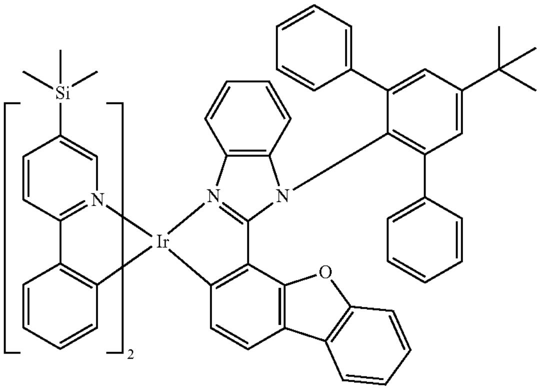
23
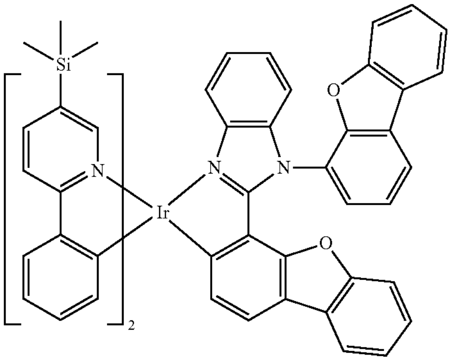
24
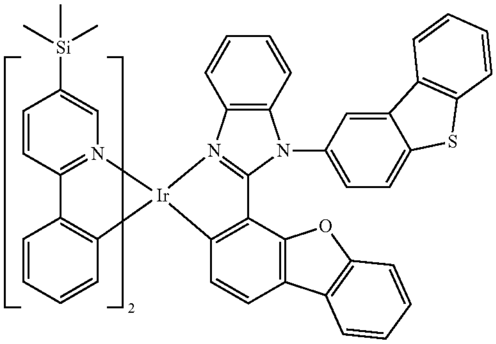
-continued
25
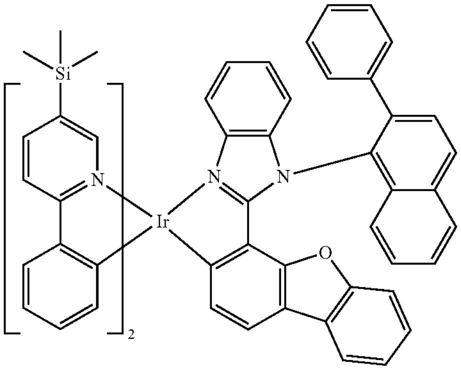
26
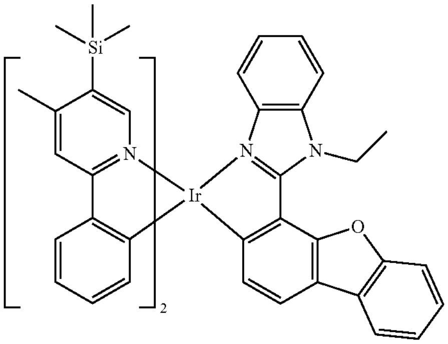
27
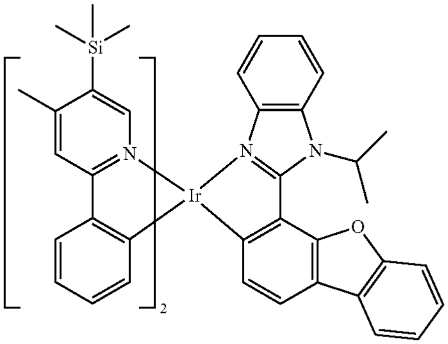
28
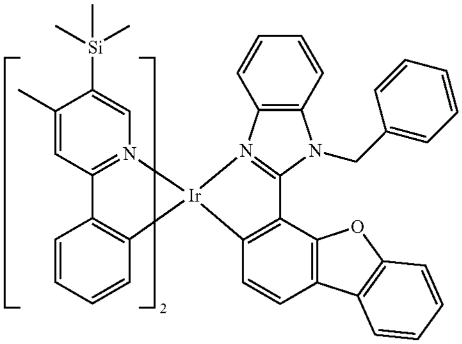

-continued
29
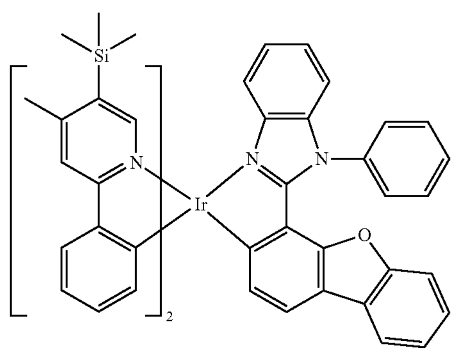
30
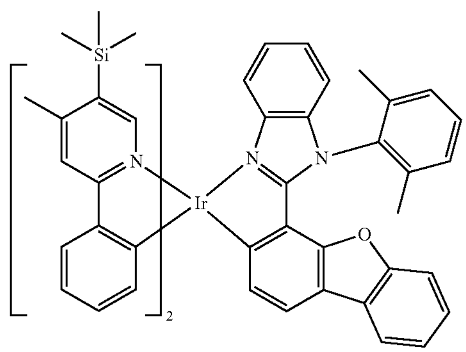
31
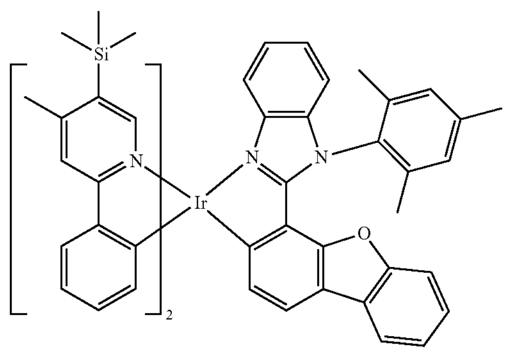
32
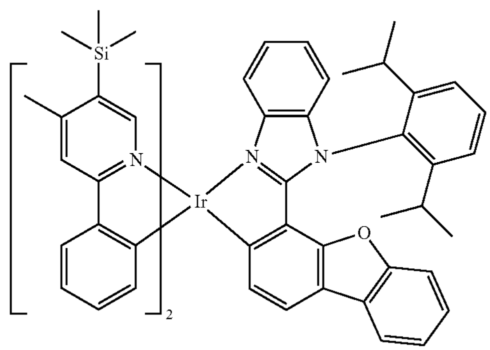
-continued
33
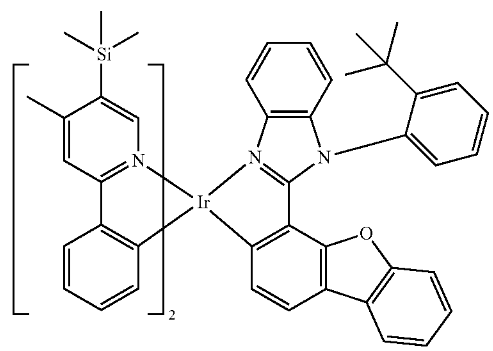
34
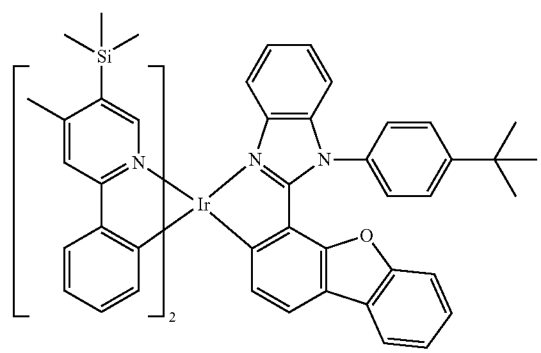
35
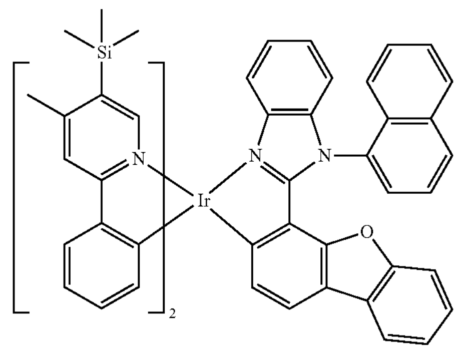
36
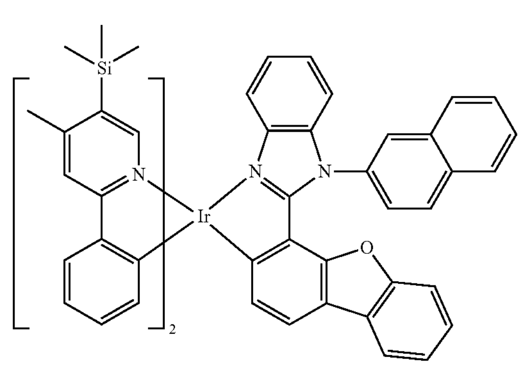

37
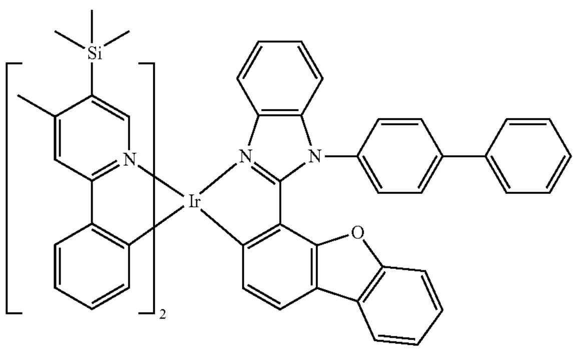
38
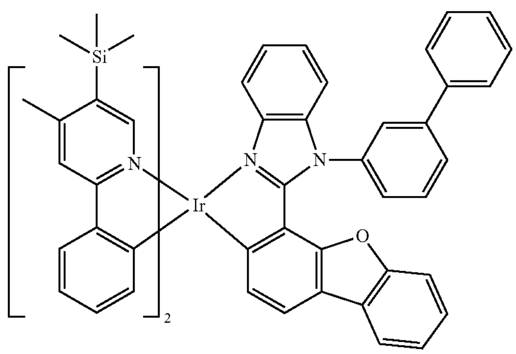
39
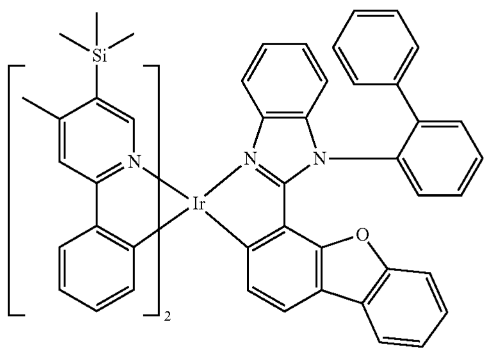
40
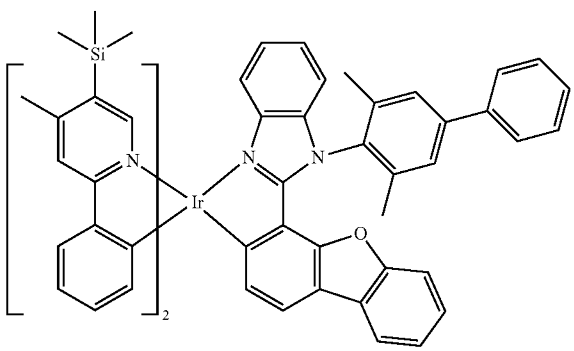
41
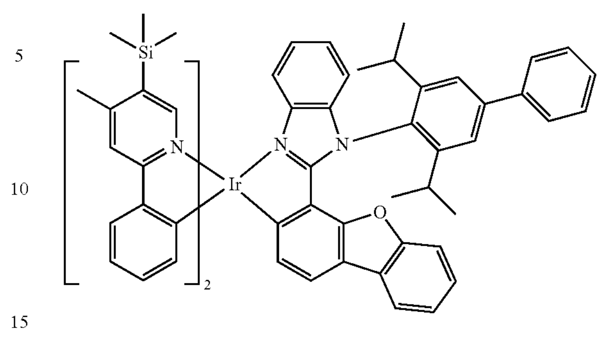
42
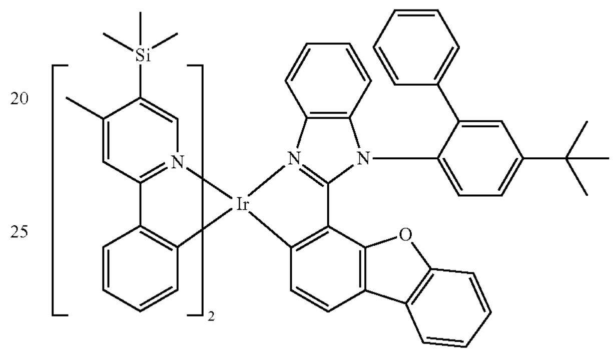
43
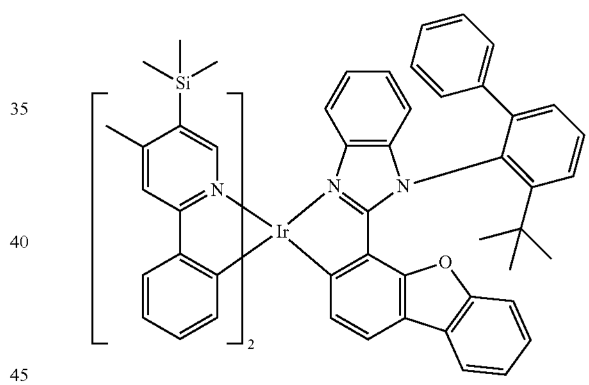
44
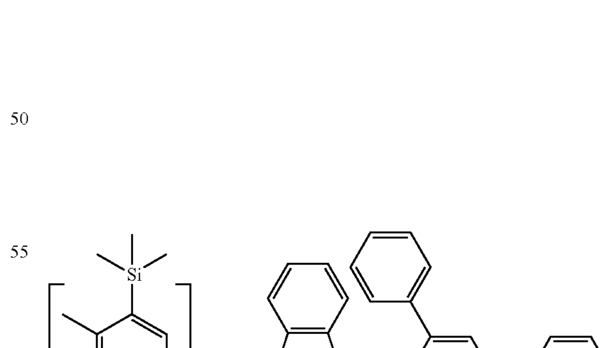
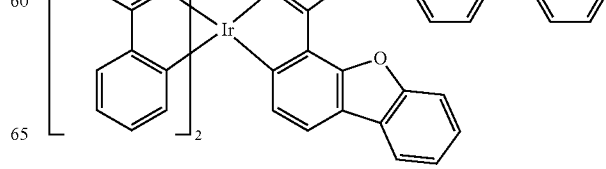

-continued
45
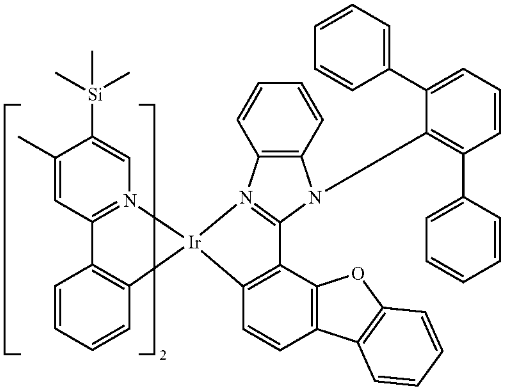
46
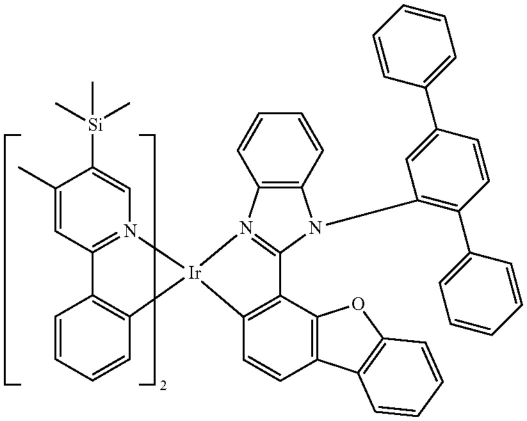
47
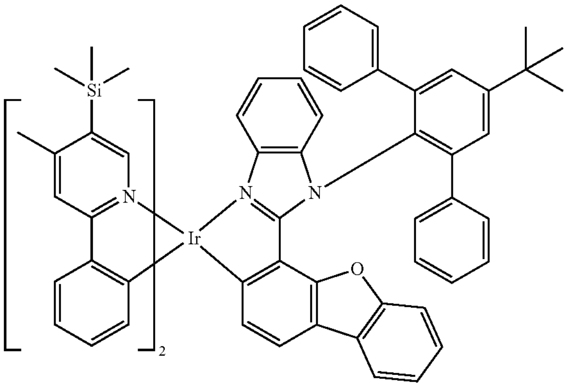
48
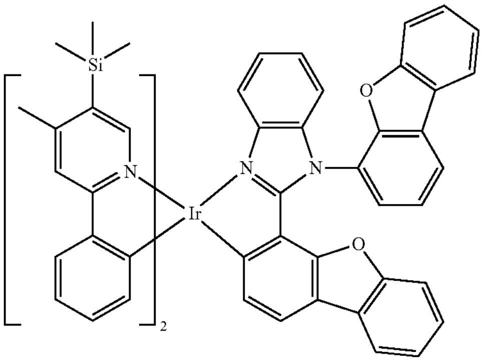
-continued
49
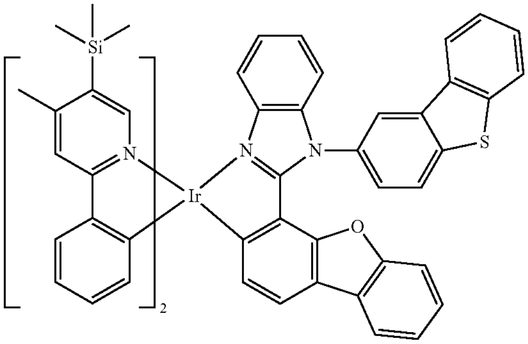
50
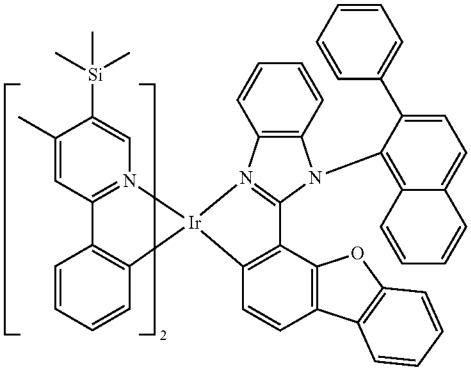
51
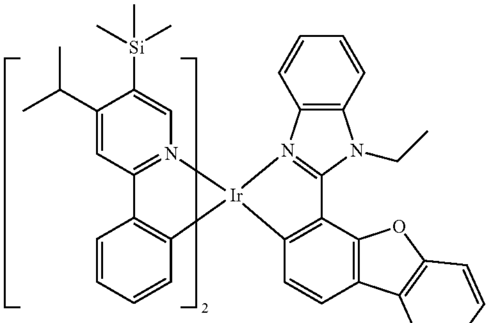
52
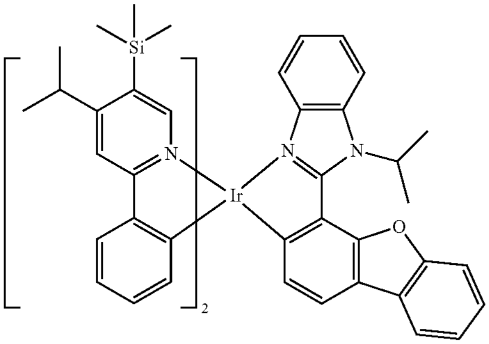

-continued
53
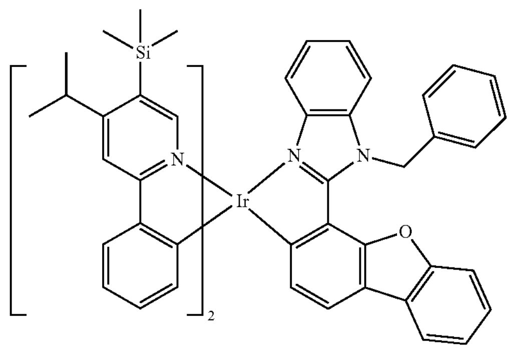
54
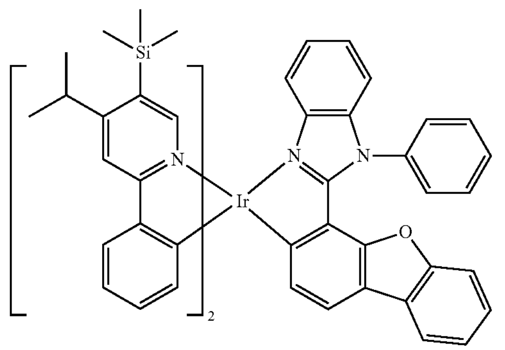
55
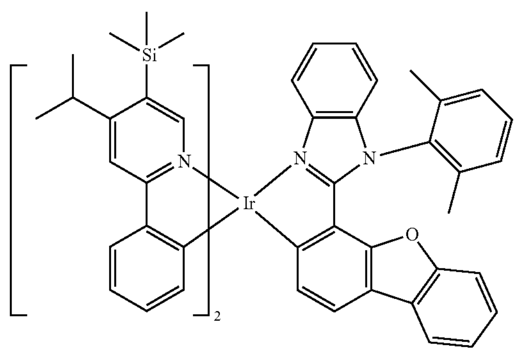
56
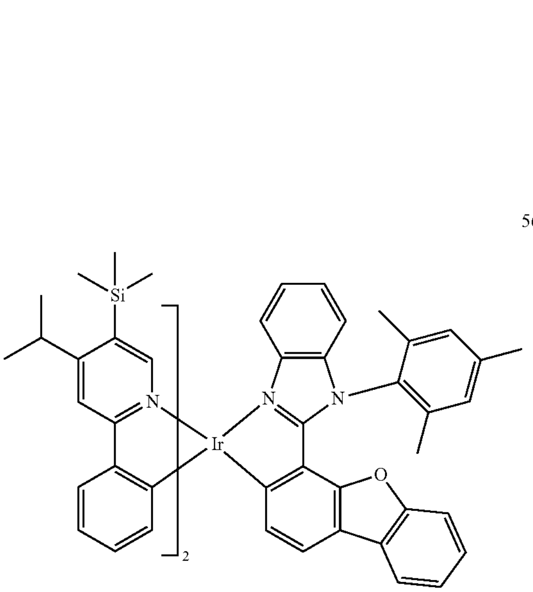
-continued
57
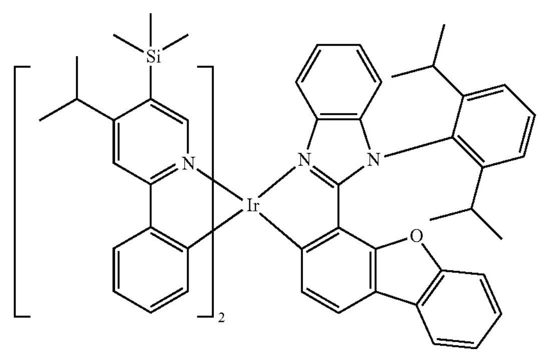
58
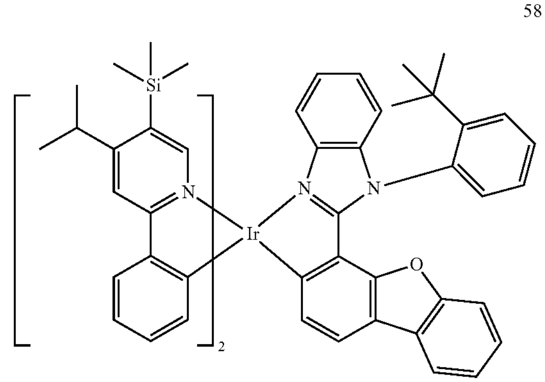
59
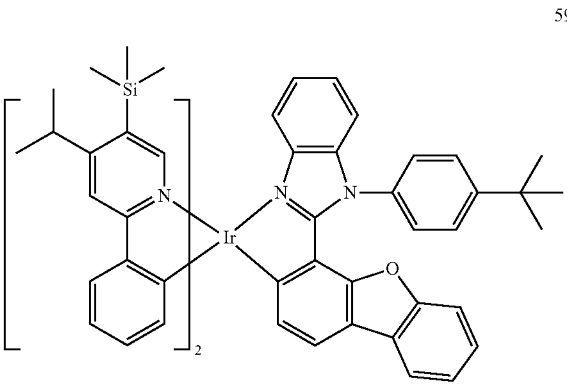
60
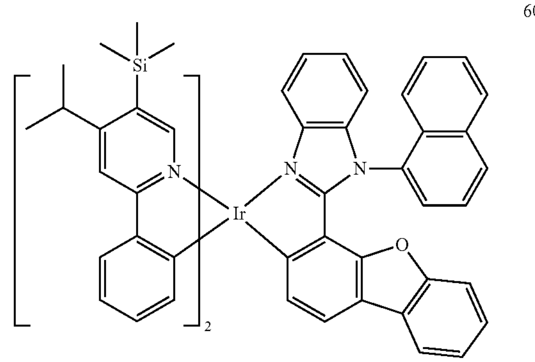

-continued
61
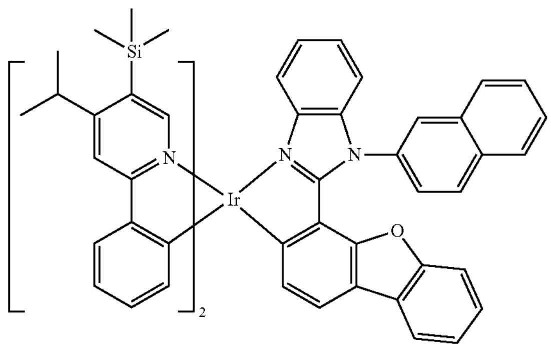
62
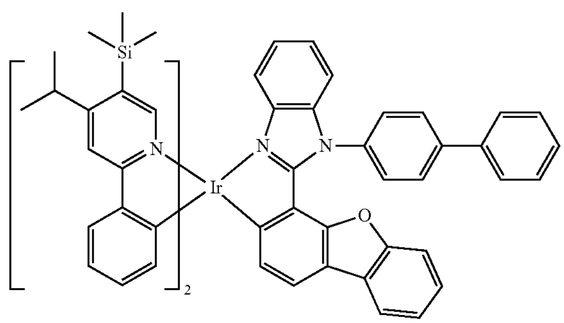
63
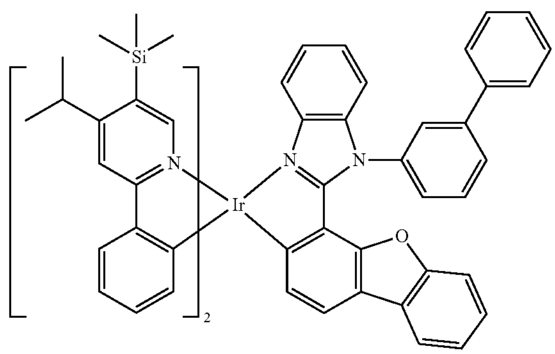
64
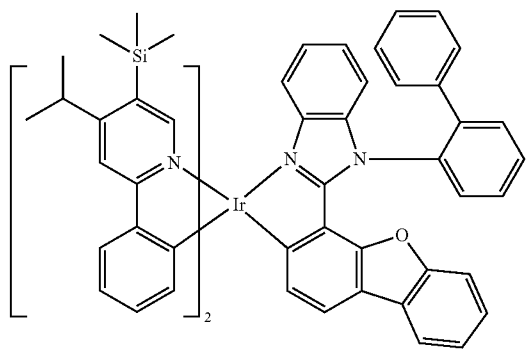
-continued
65
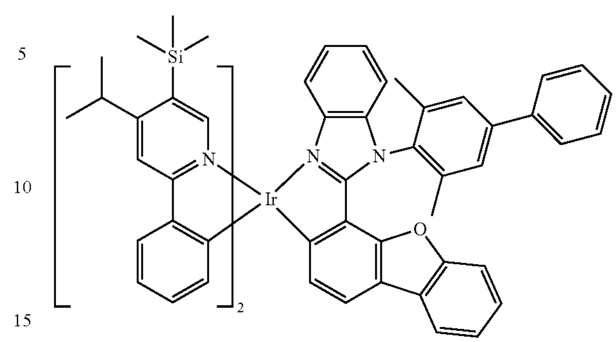
66
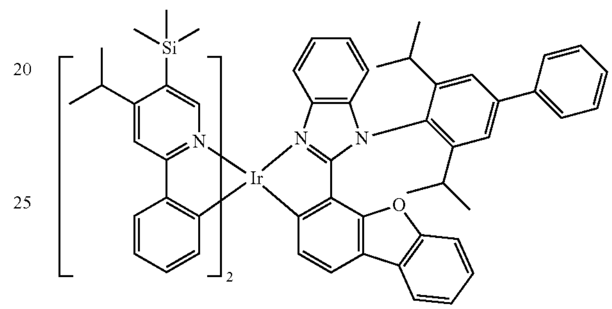
67
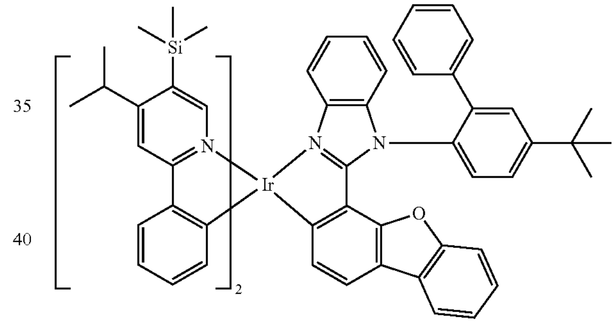
68
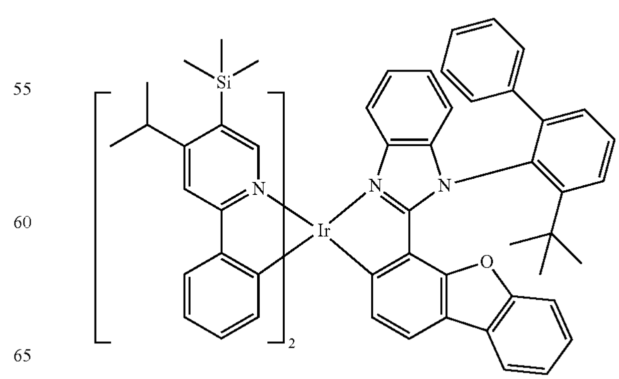

-continued
69
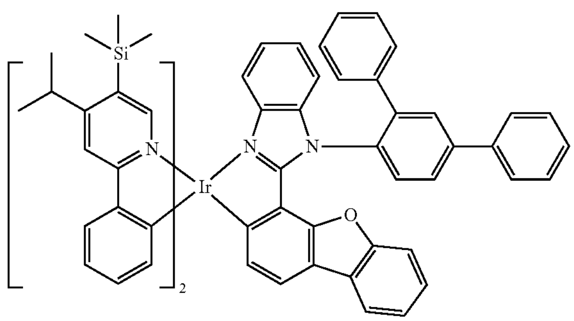
70
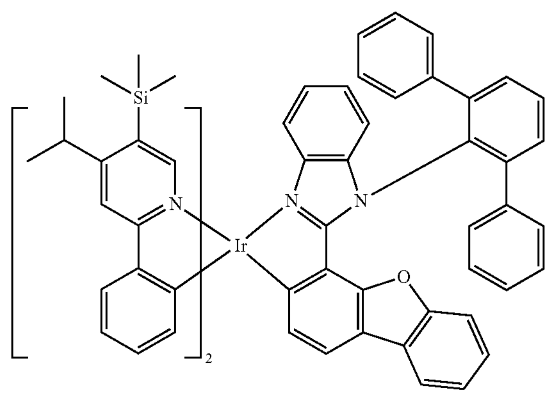
71
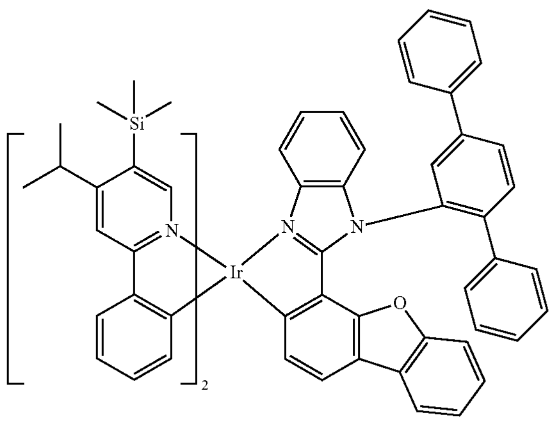
72
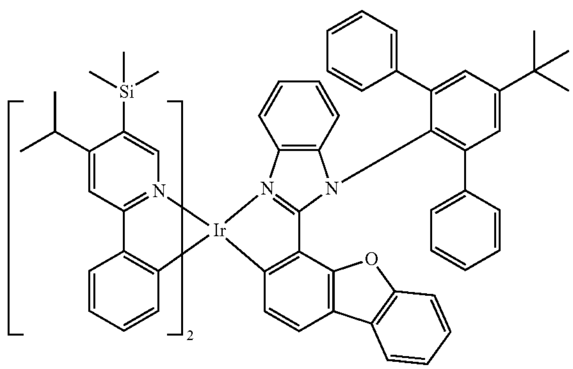
-continued
73
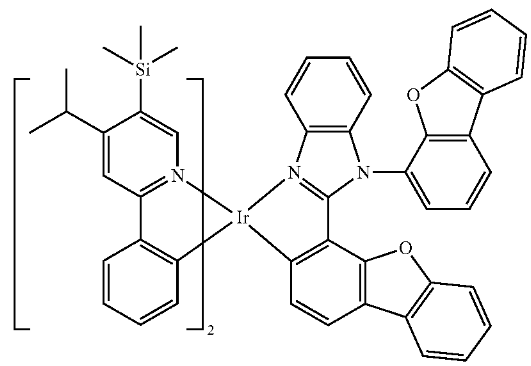
74
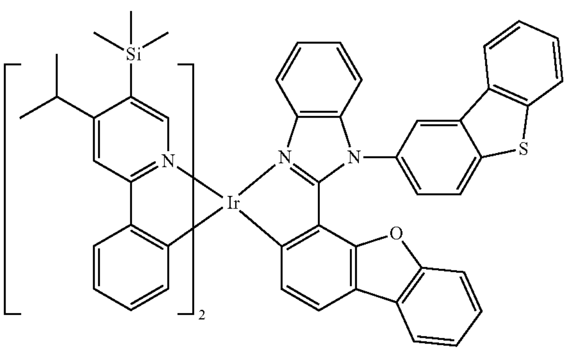
75
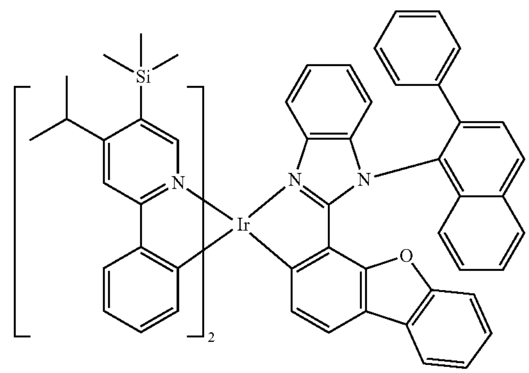
76
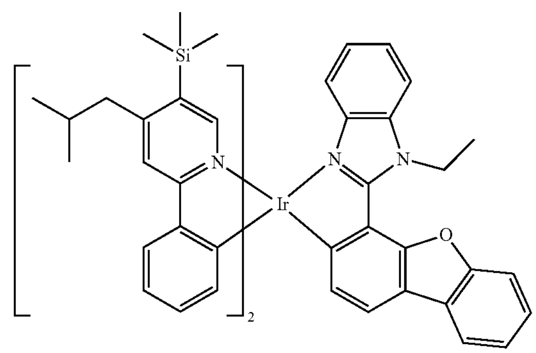

-continued
77
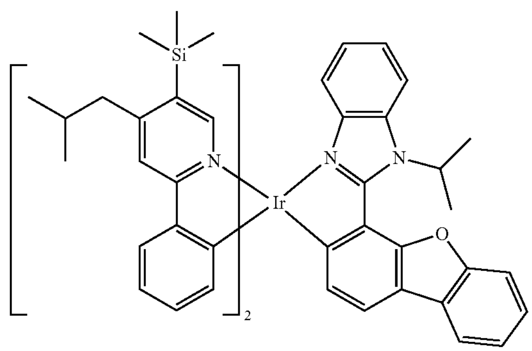
78
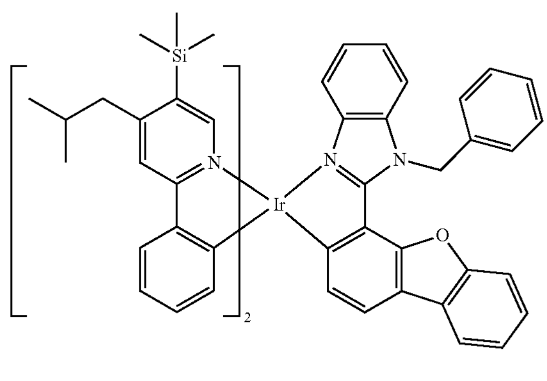
79
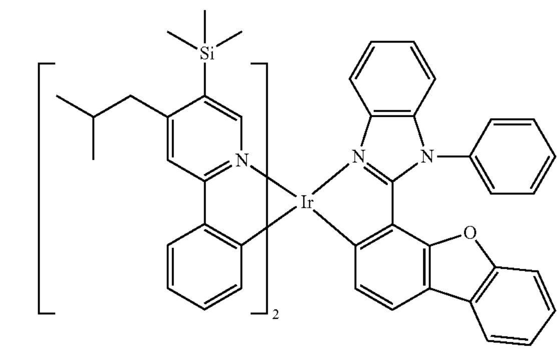
80
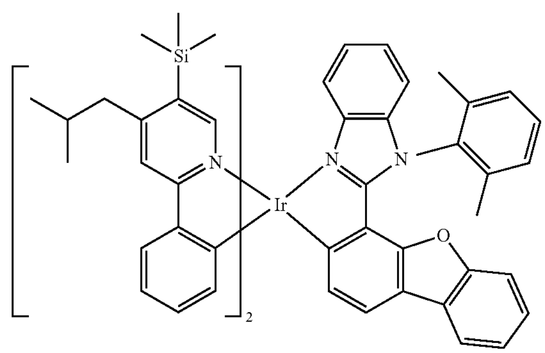
-continued
81
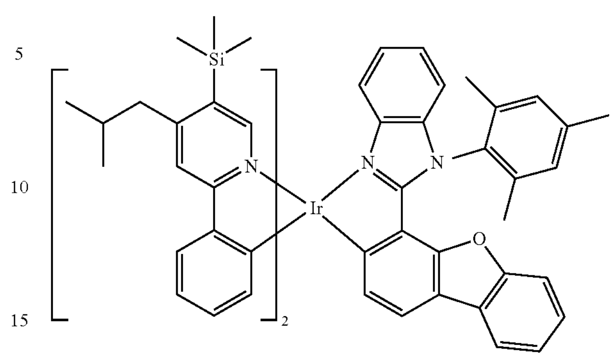
82
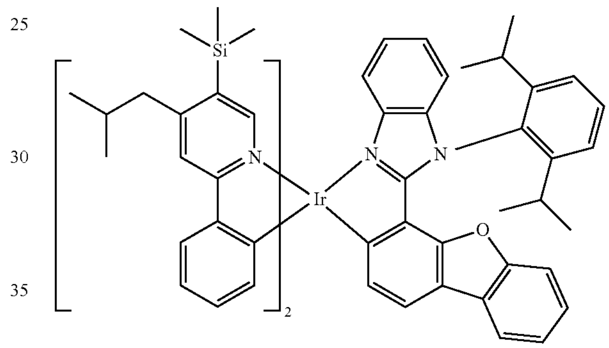
83
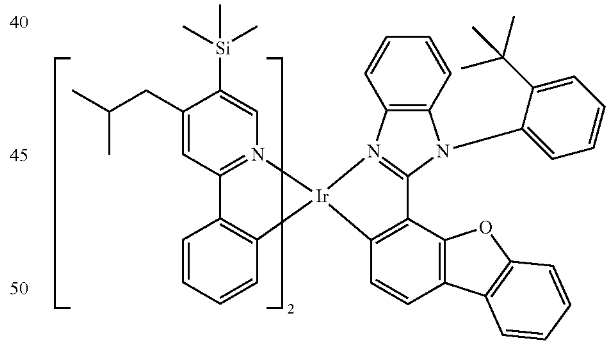
84
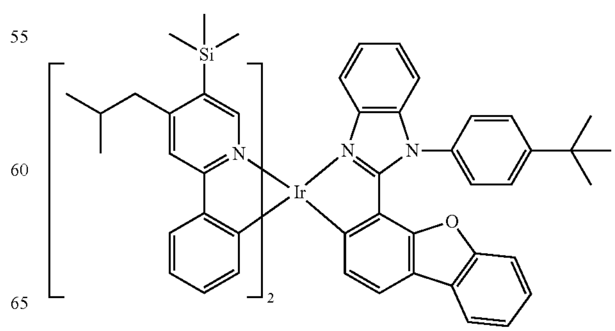

-continued
85
86
87
88
-continued
89
90
91
92
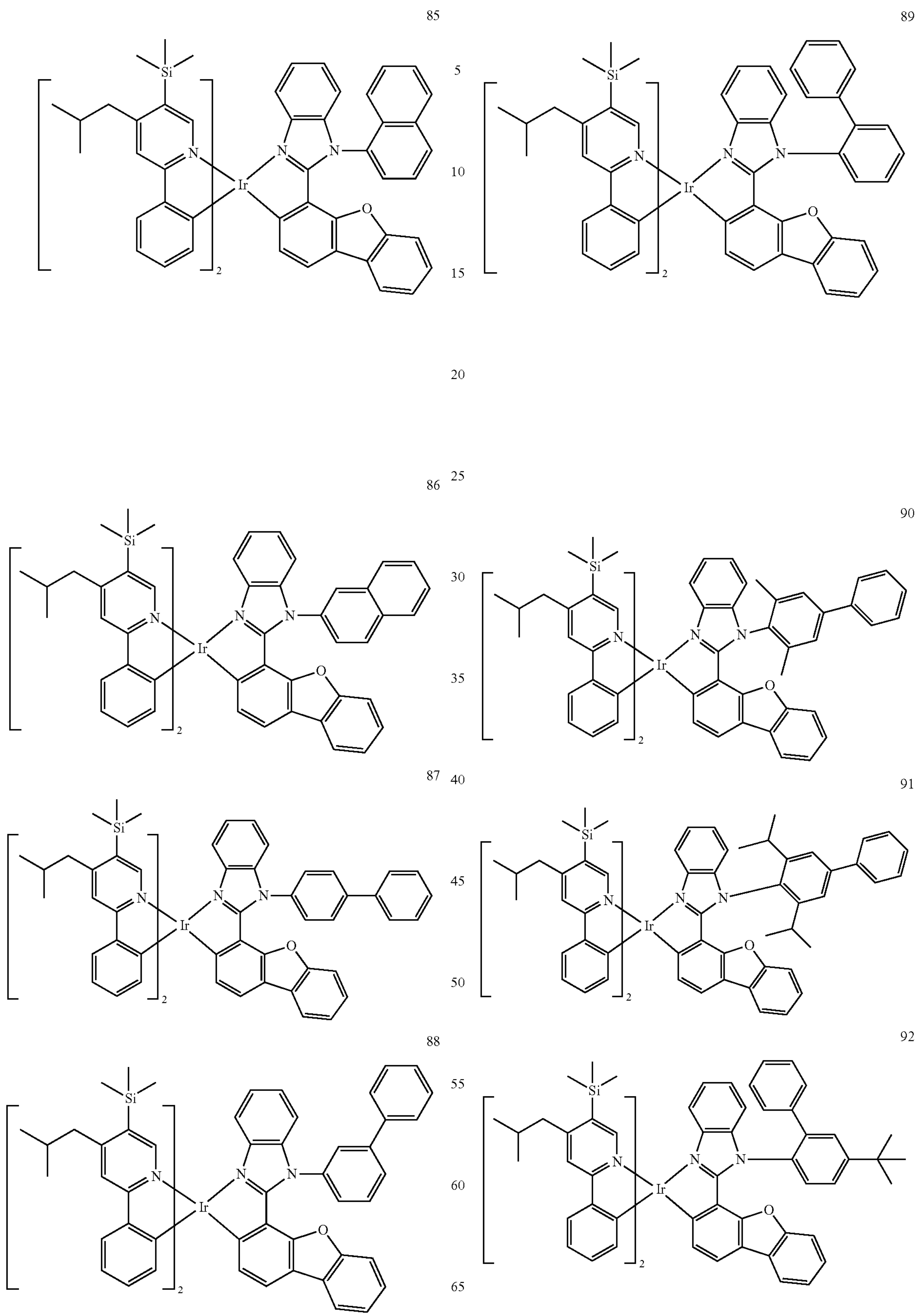

-continued
93
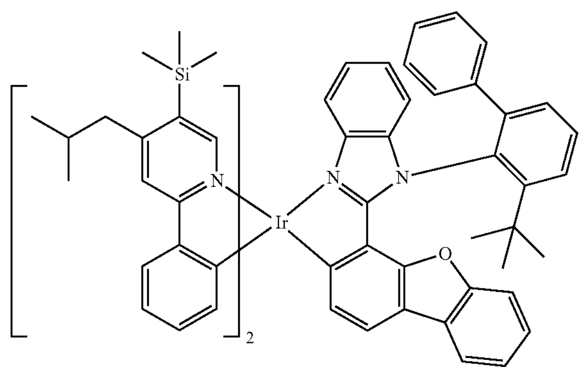
94
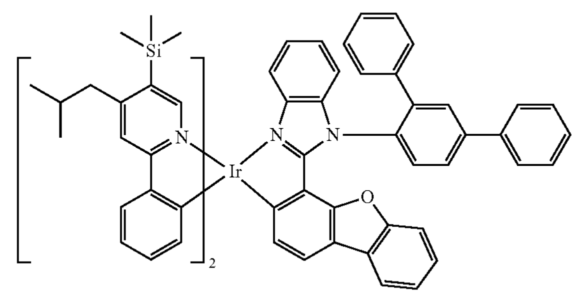
95
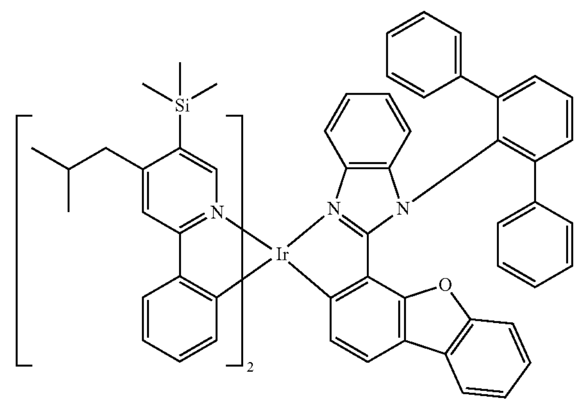
96
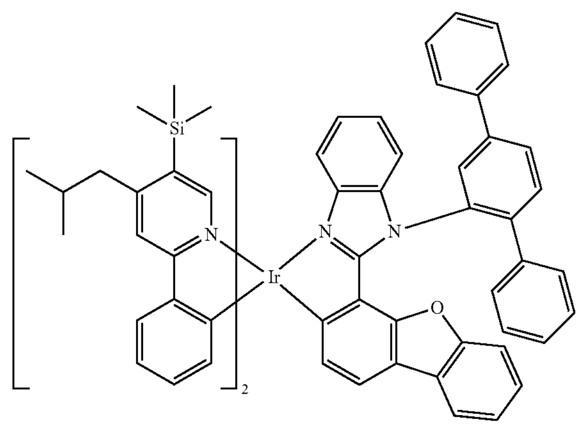
-continued
97
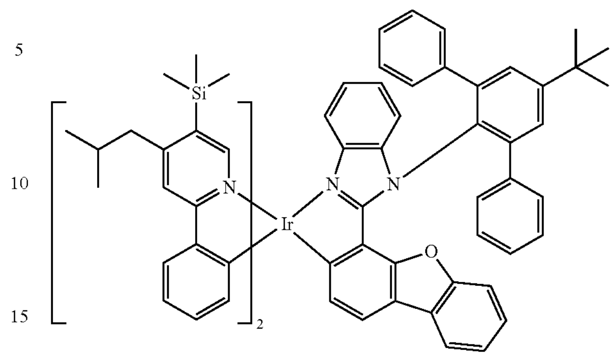
98
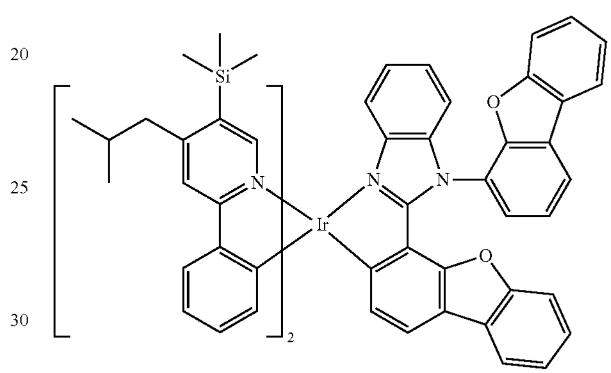
99
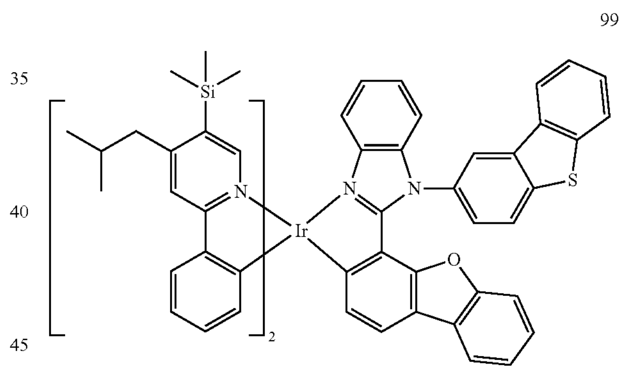
100
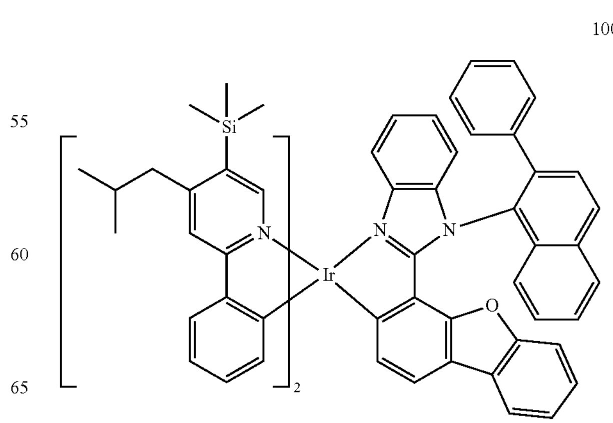

-continued
101
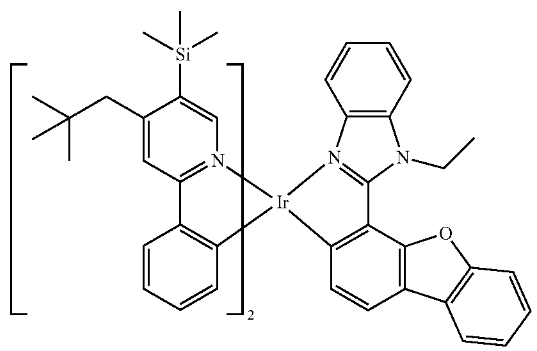
102
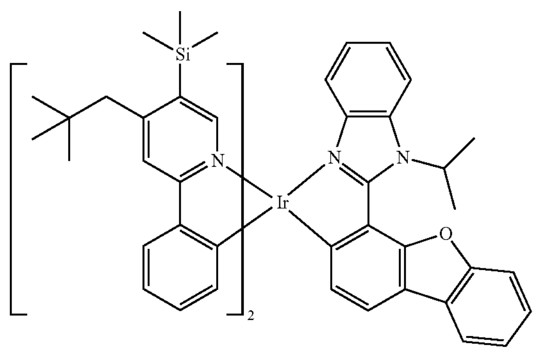
103
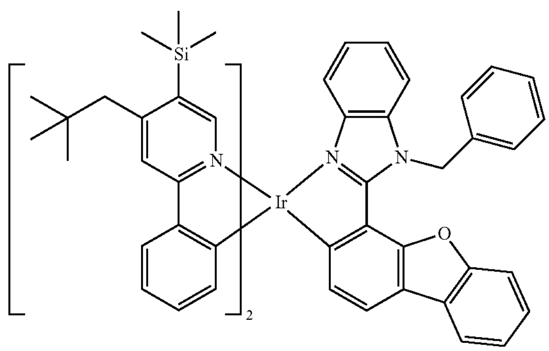
104
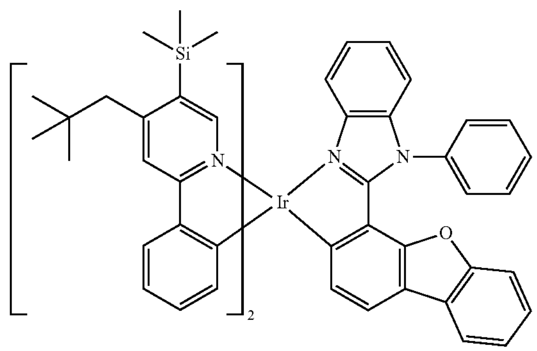
-continued
105
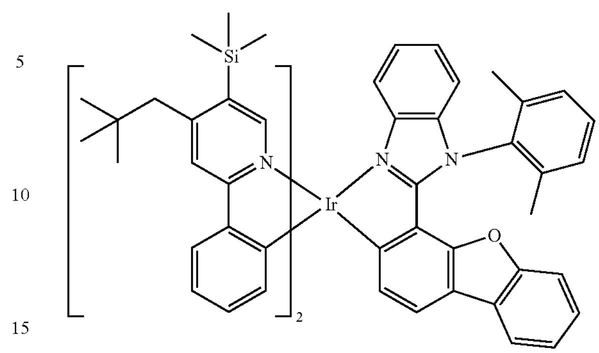
106
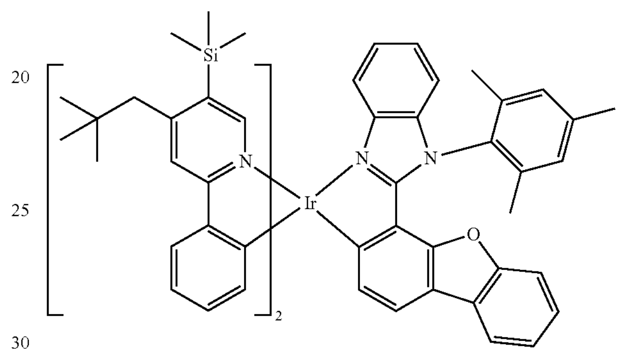
107
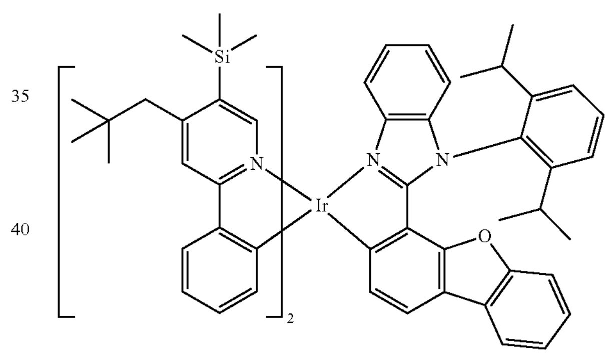
108
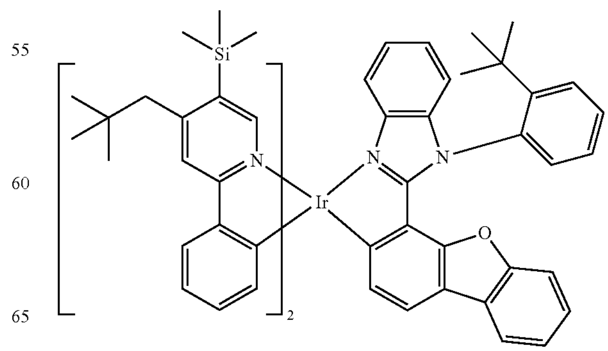

-continued
109
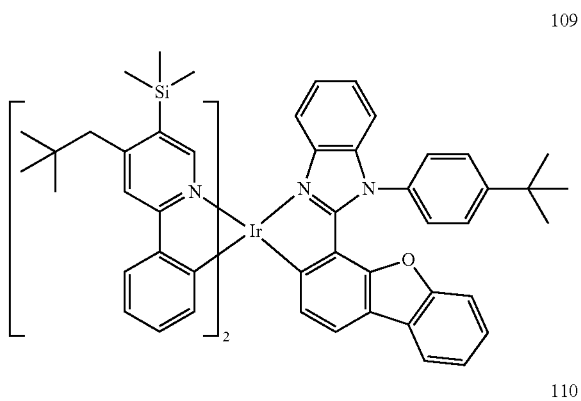
110
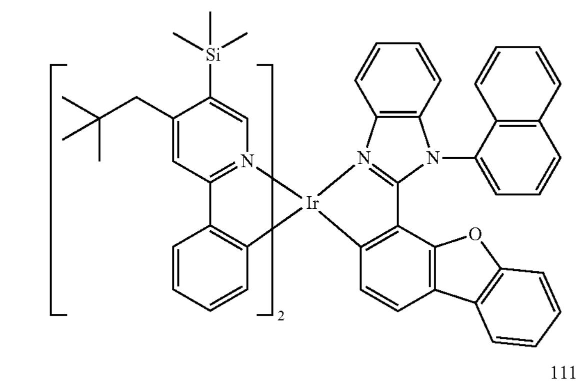
111
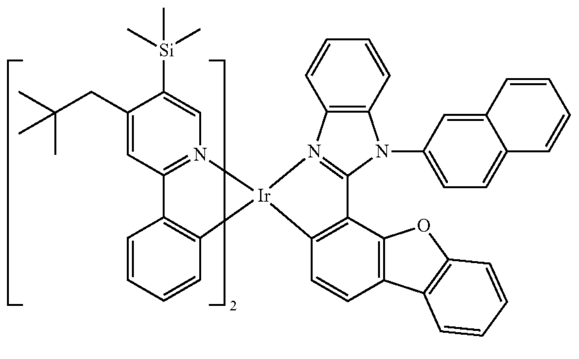
112
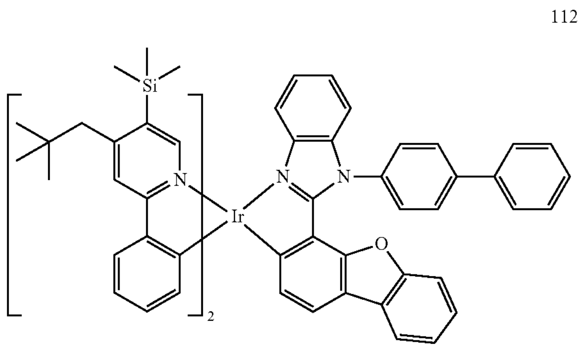
-continued
113
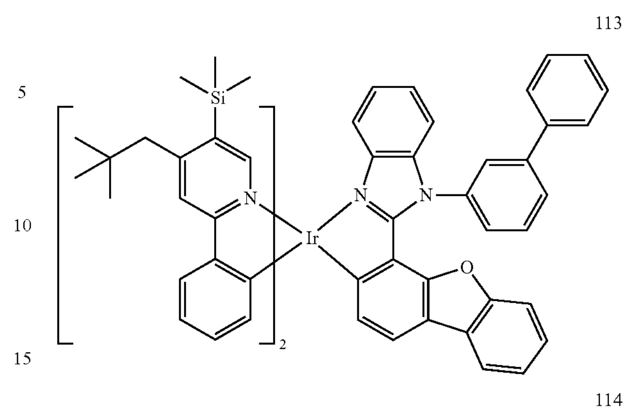
114
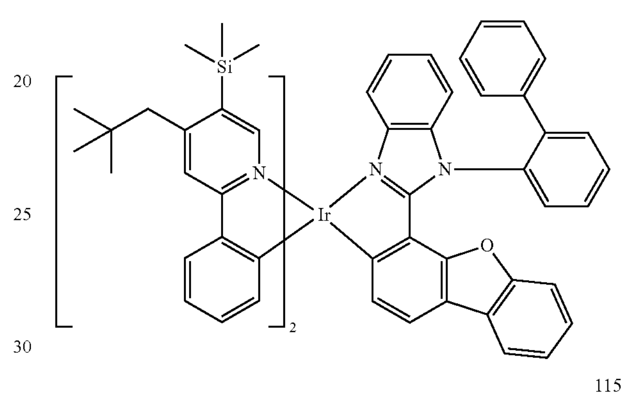
115
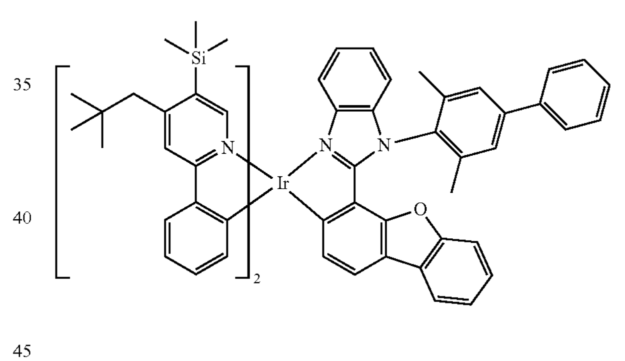
116
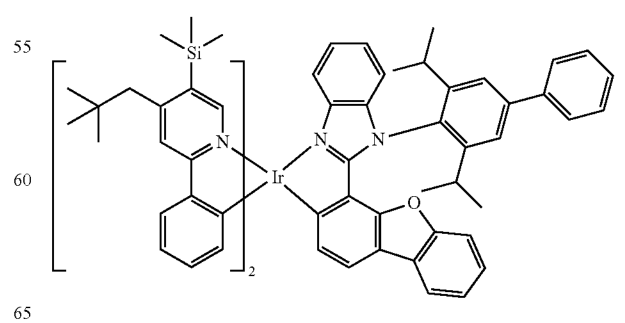

-continued
117
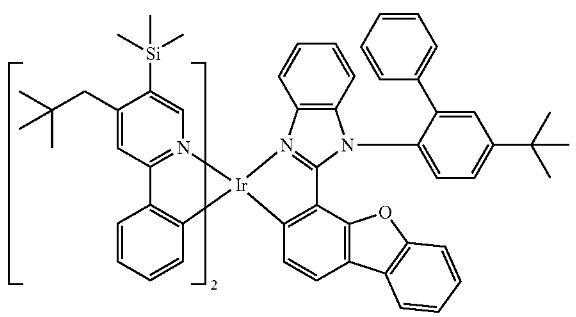
118
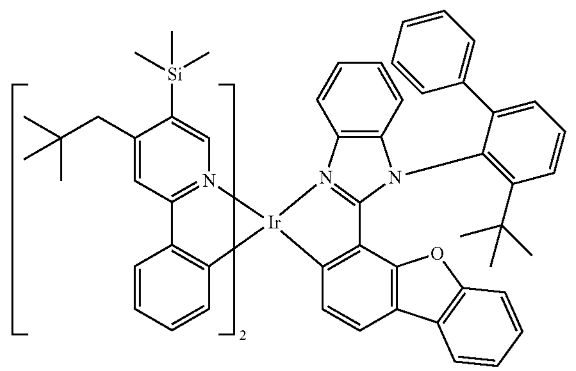
119
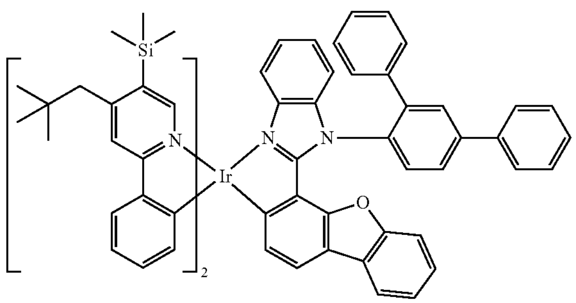
120
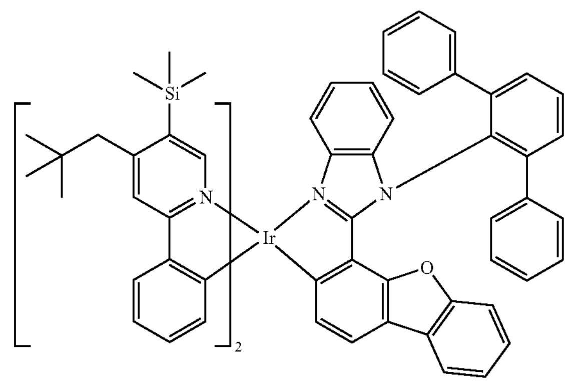
-continued
121
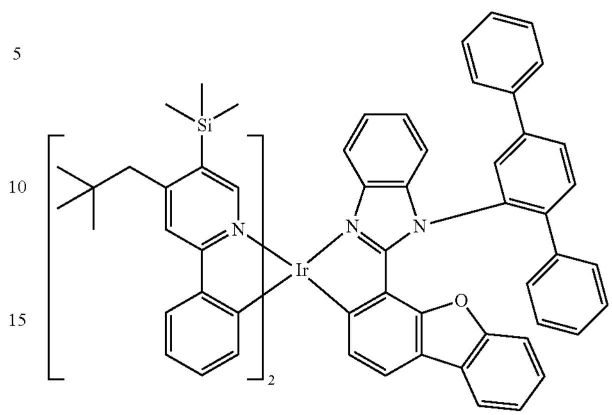
122
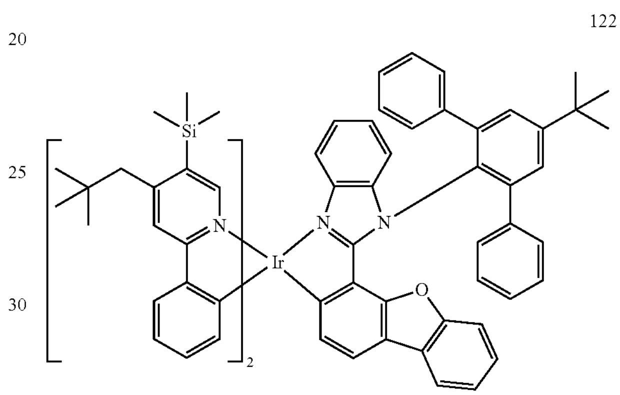
123
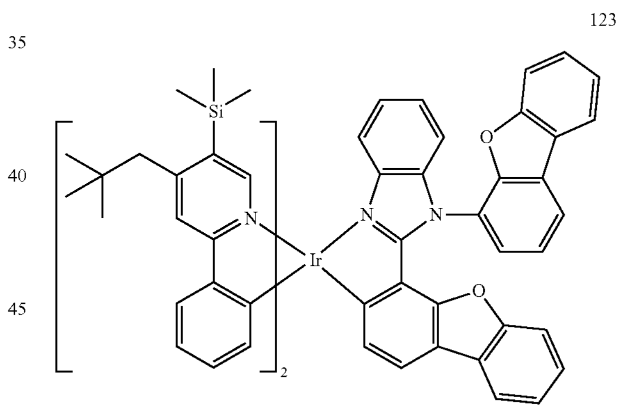
124
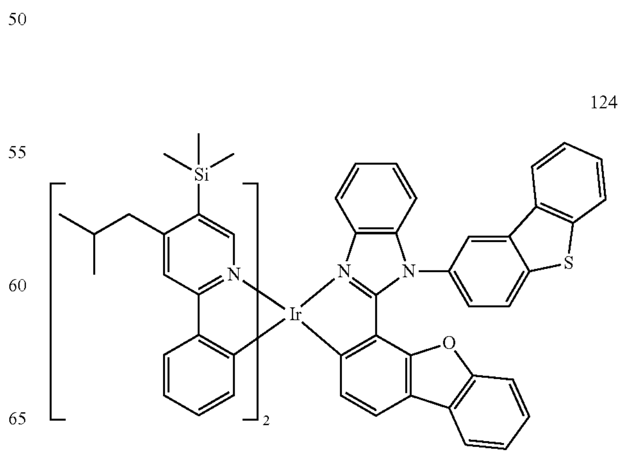

-continued
125
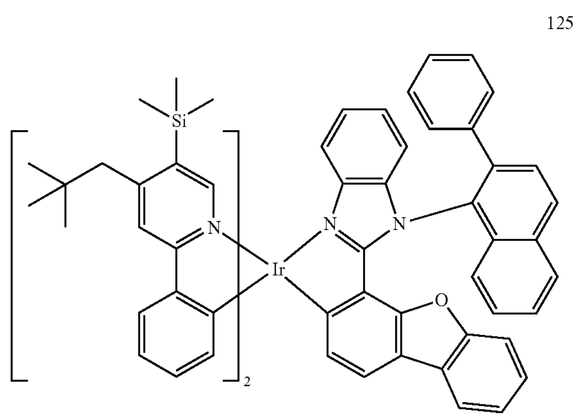
126
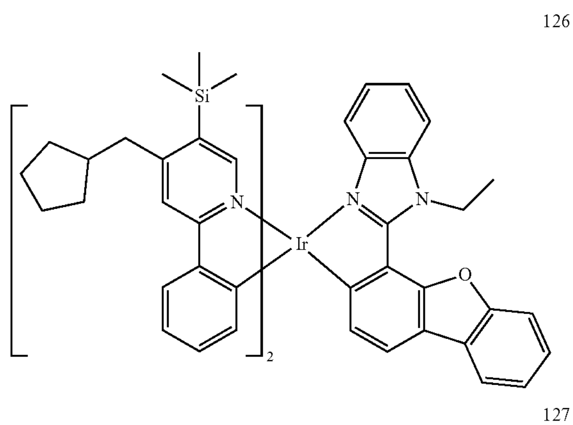
127
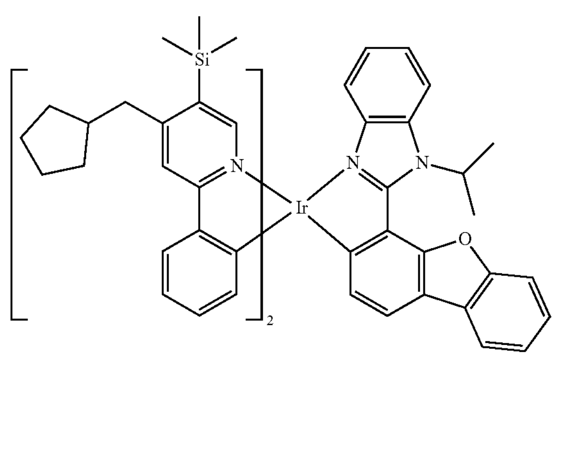
128
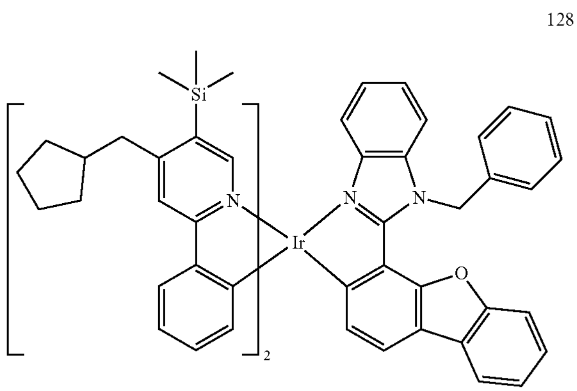
-continued
129
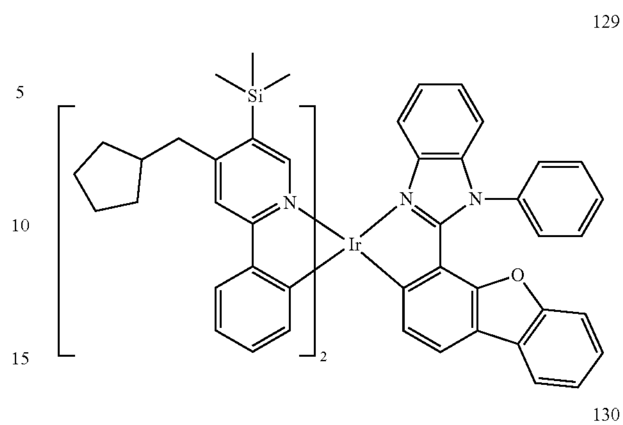
130
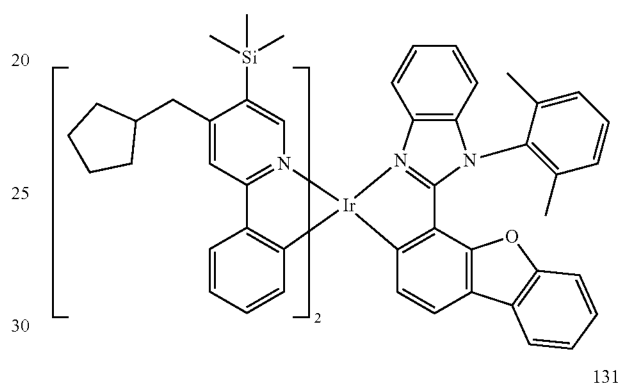
131
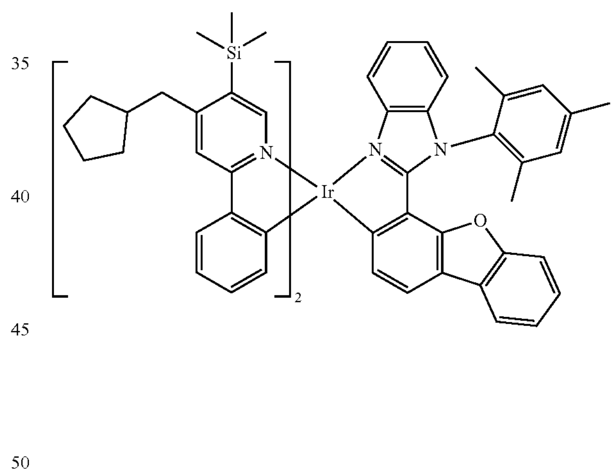
132
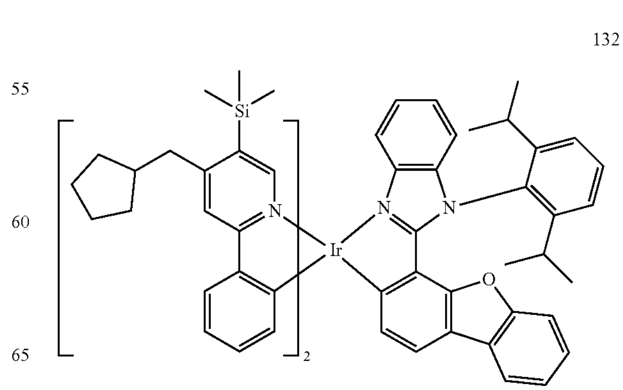

-continued
133
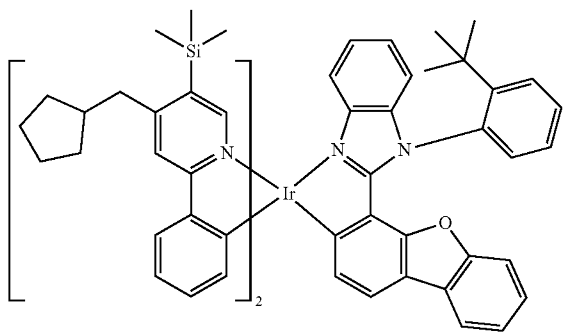
134
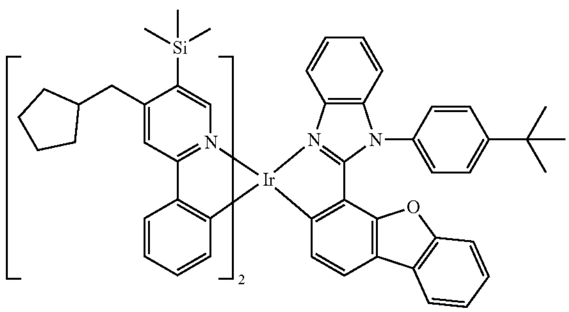
135
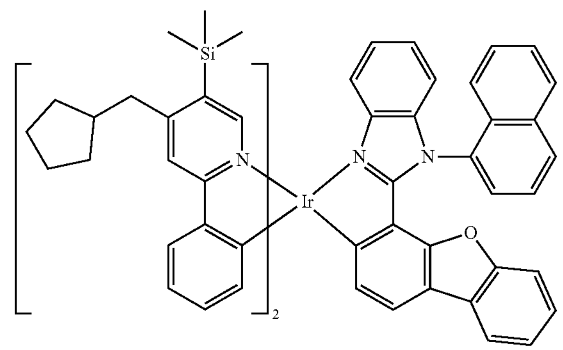
136
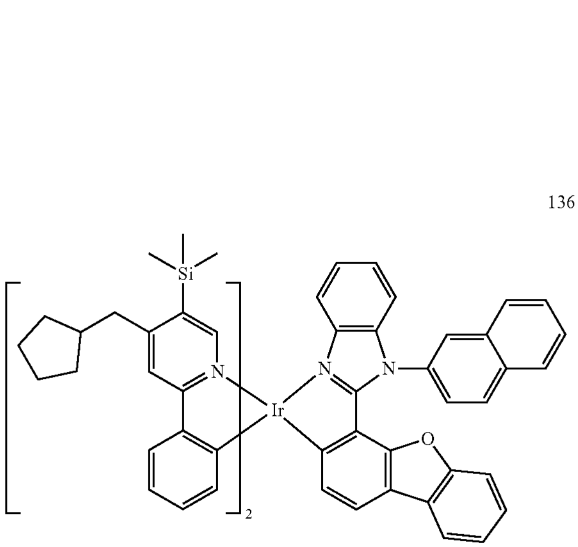
-continued
137
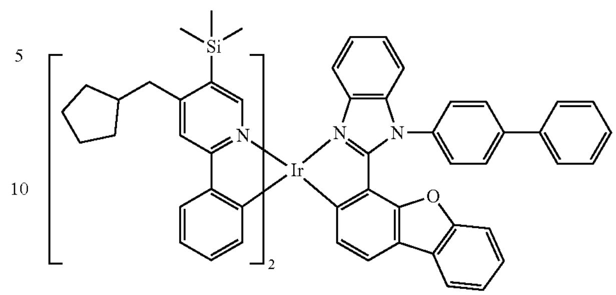
138
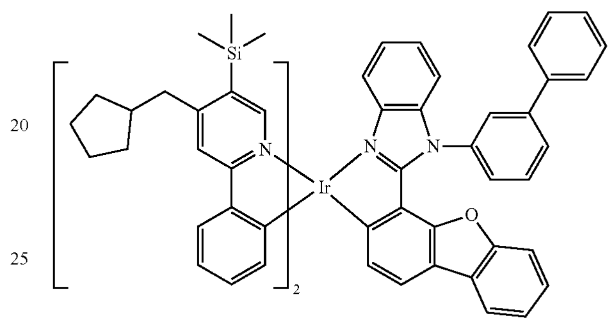
139
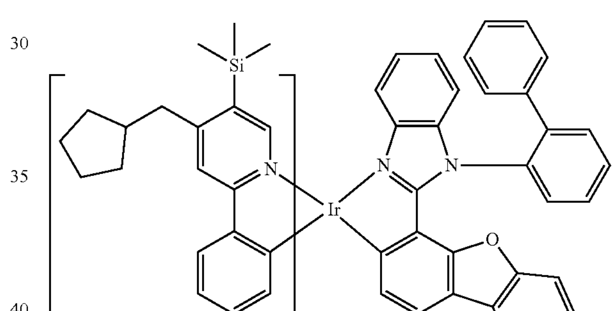
140
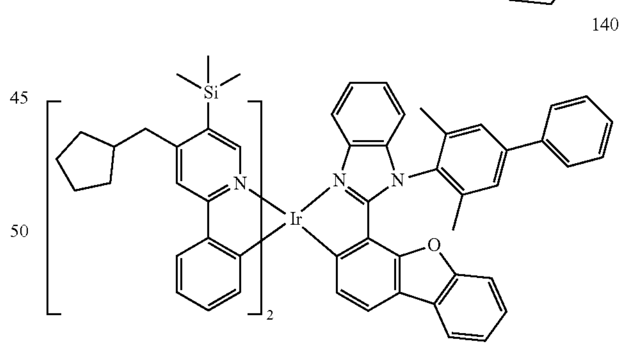
141
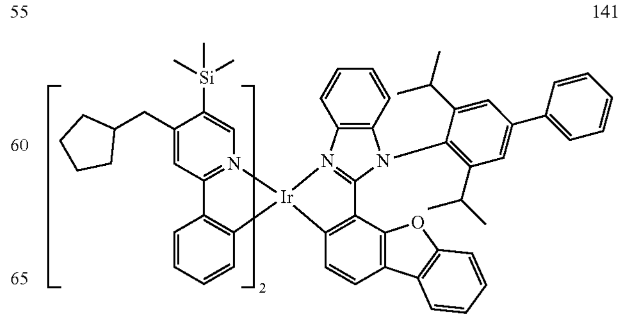

142
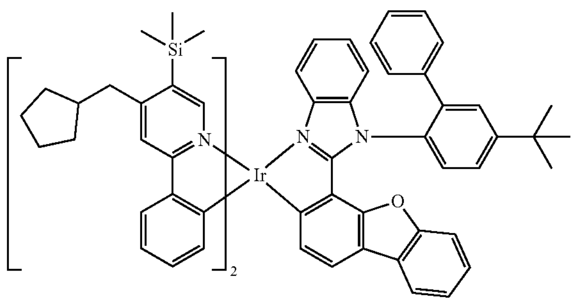
143
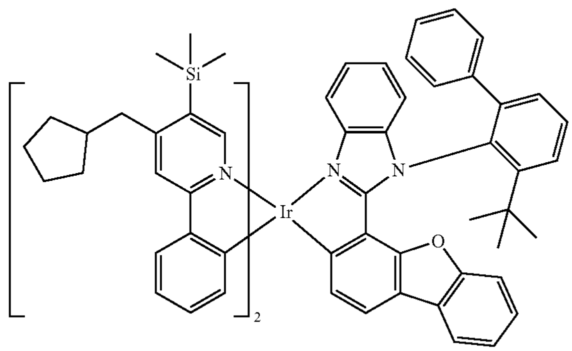
144
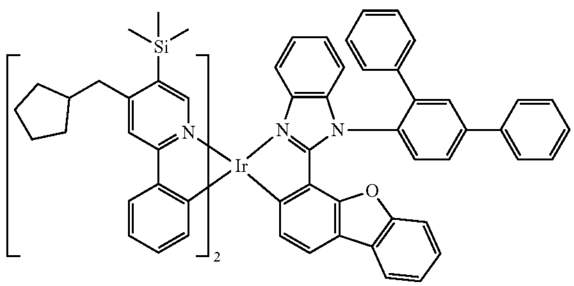
145
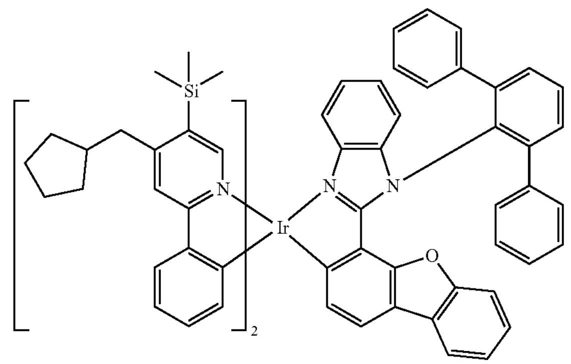
146
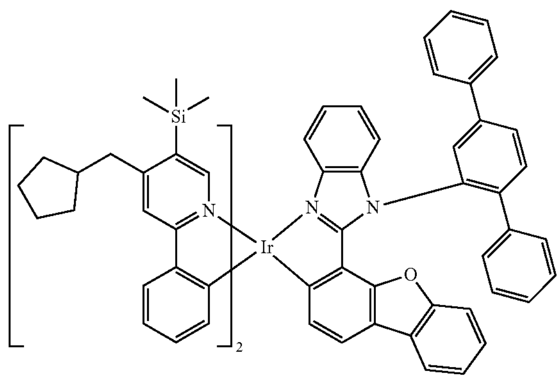
147
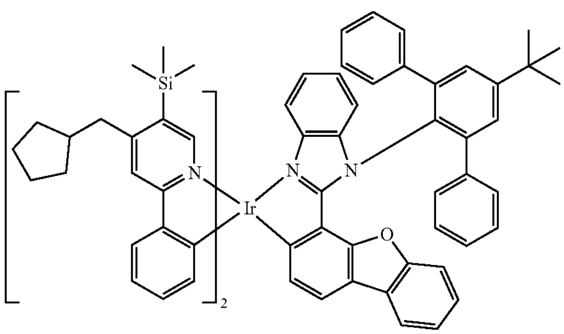
148
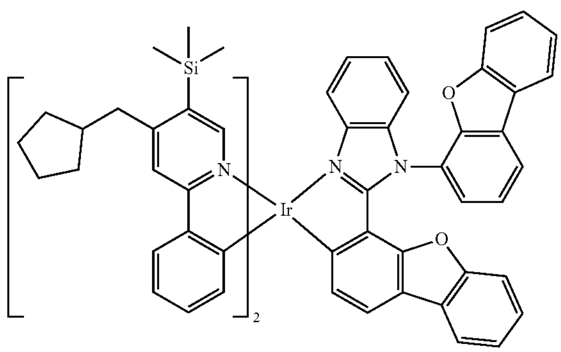
149
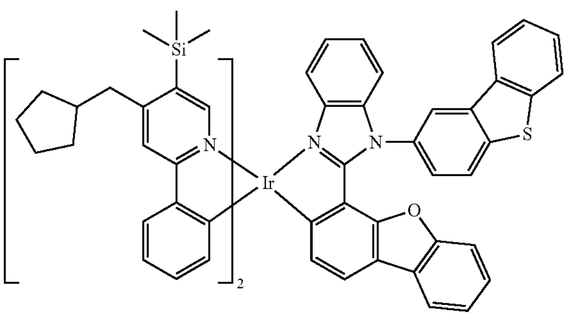

-continued
150
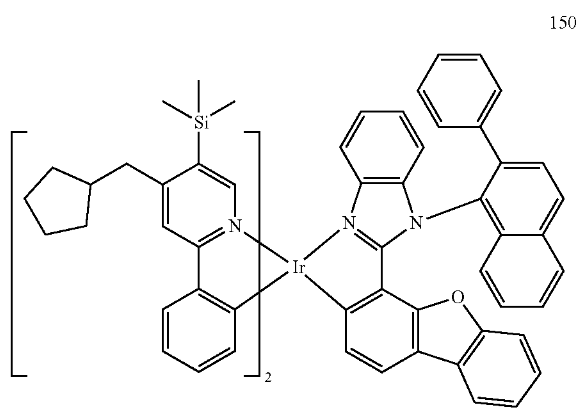
151
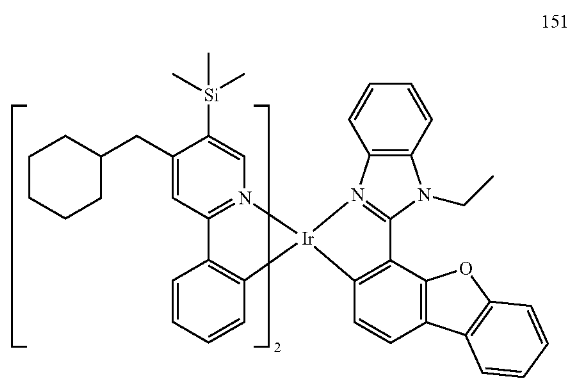
152
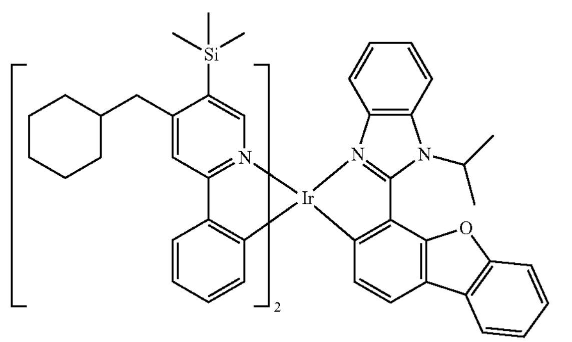
153
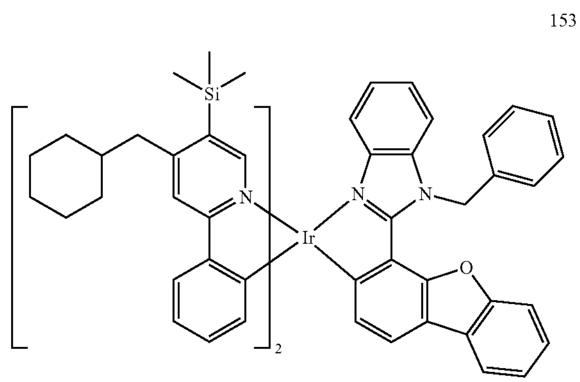
-continued
154
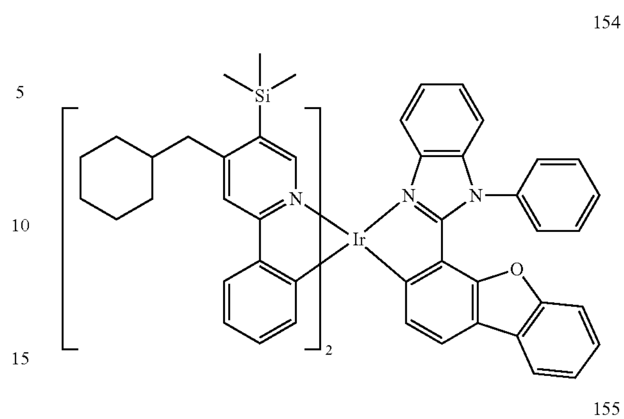
155
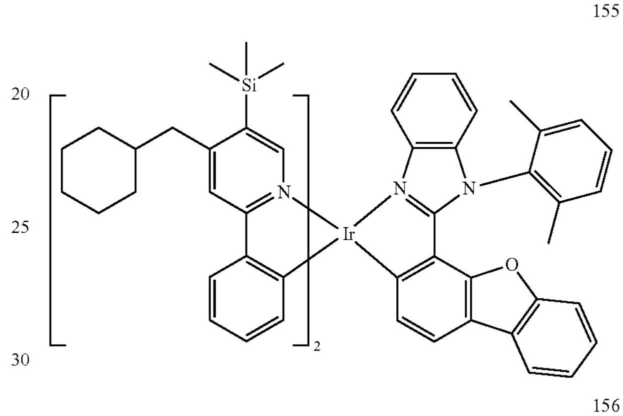
156
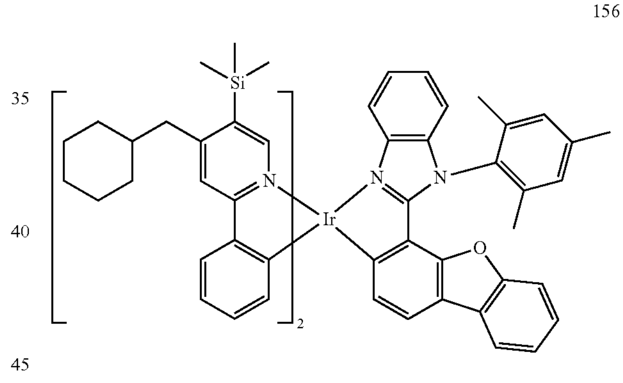
157
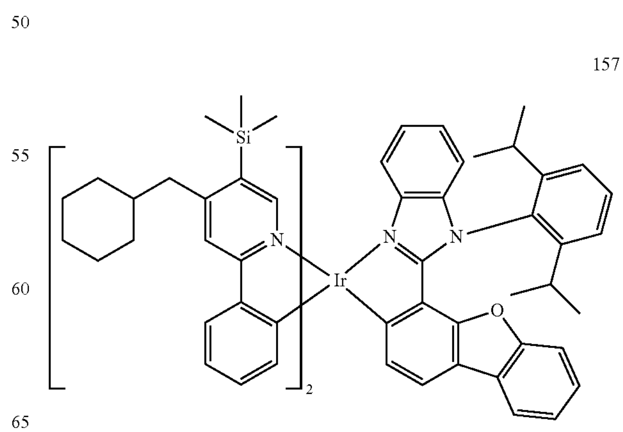

-continued
158
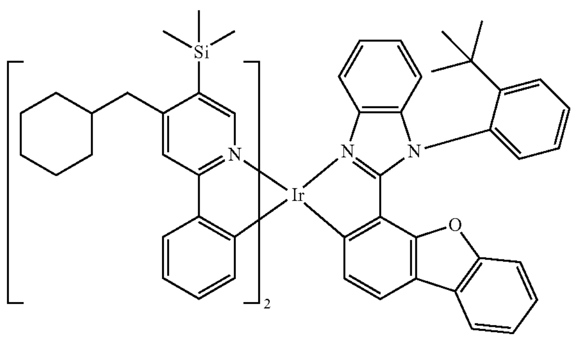
159
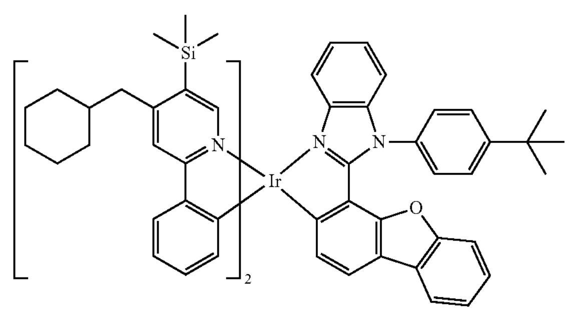
160
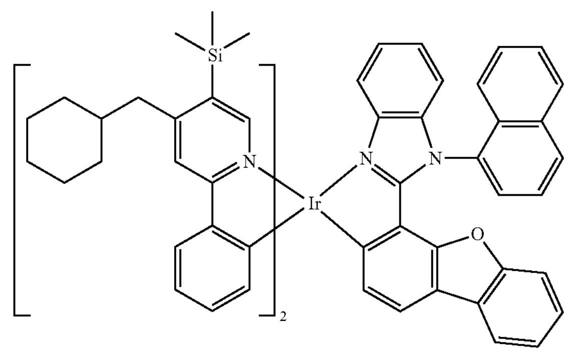
161
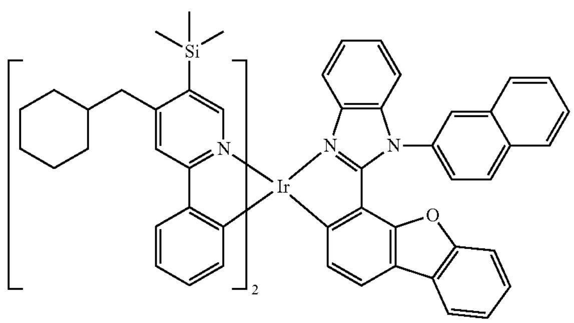
-continued
162
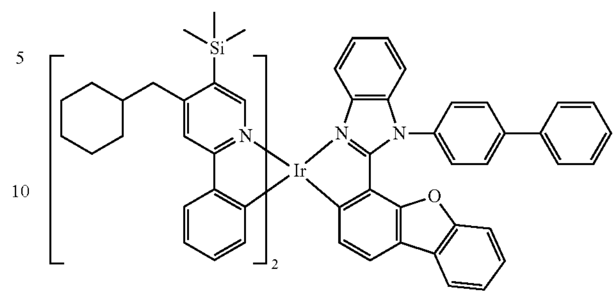
163
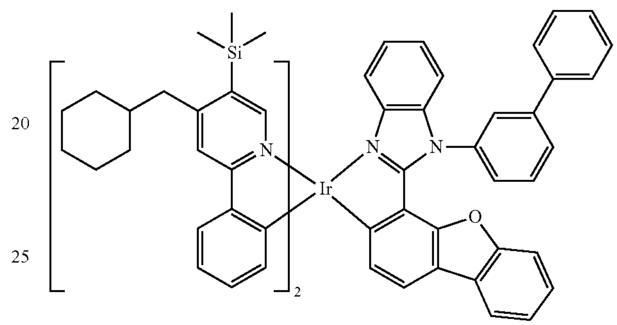
164
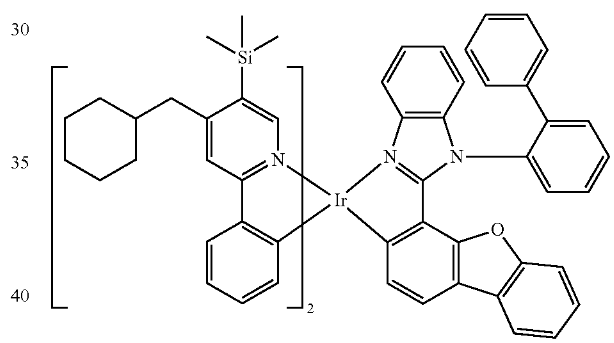
165
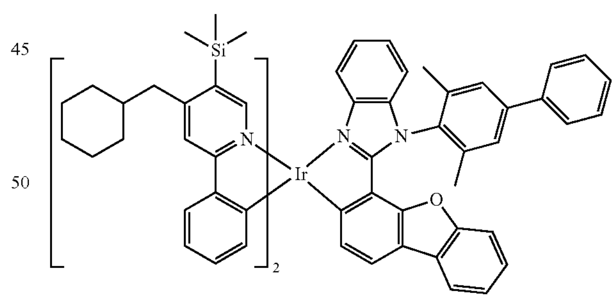
166
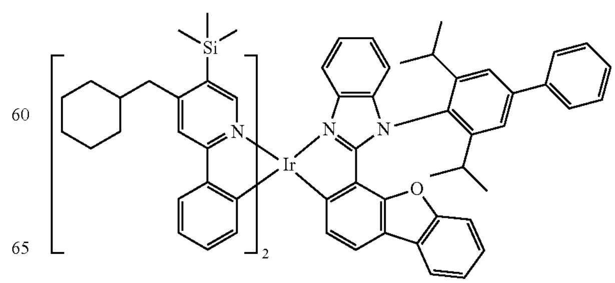

-continued
167
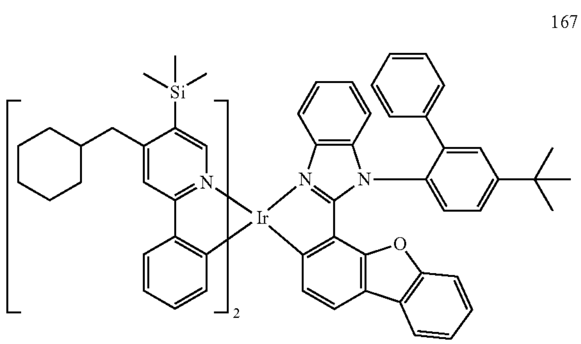
168
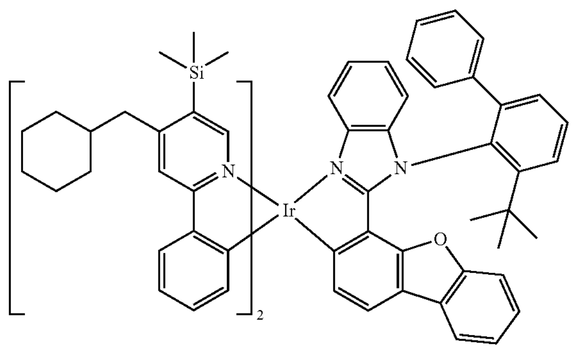
169
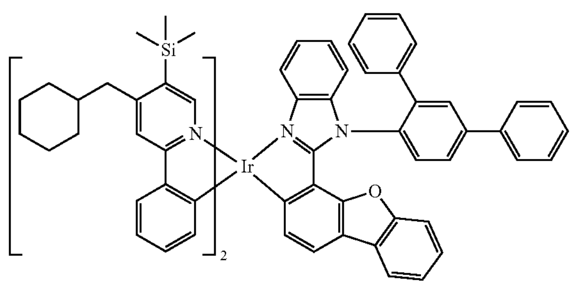
170
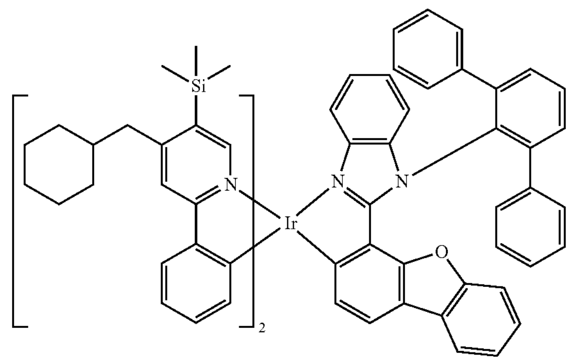
-continued
171
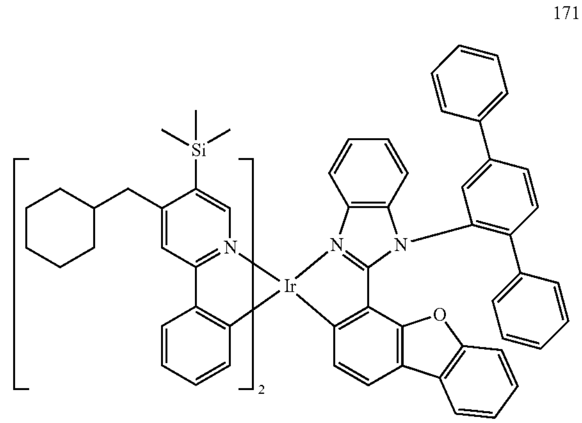
172
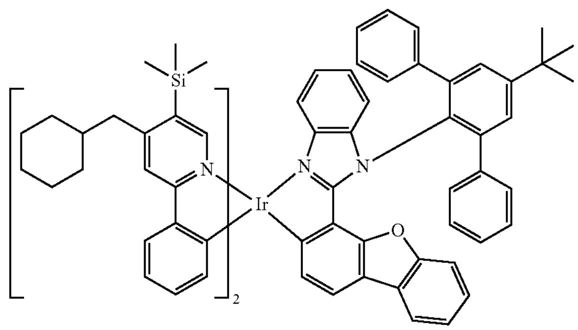
173
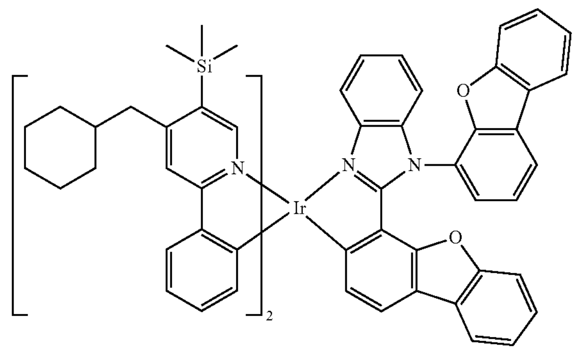
174
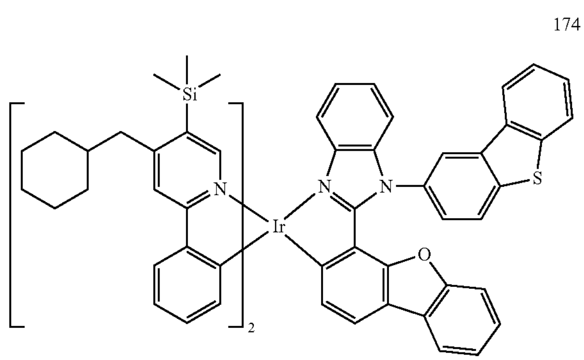

-continued
175
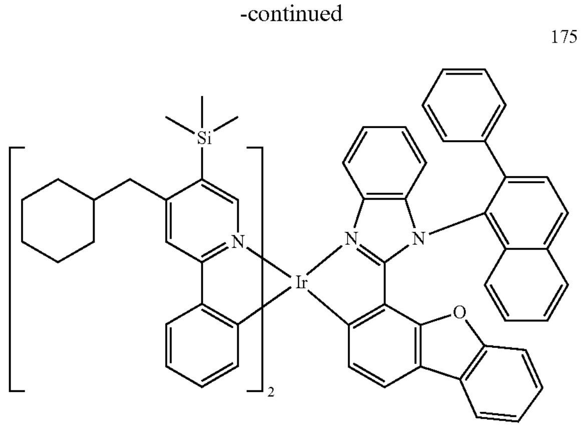
176
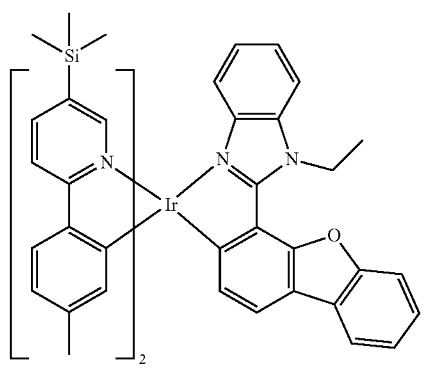
177
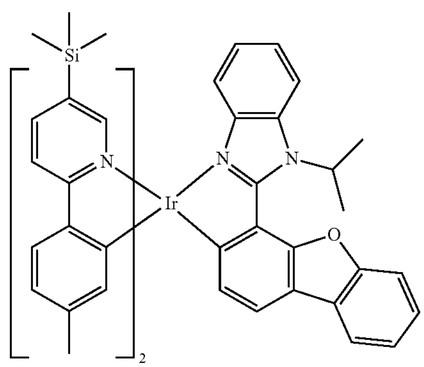
178
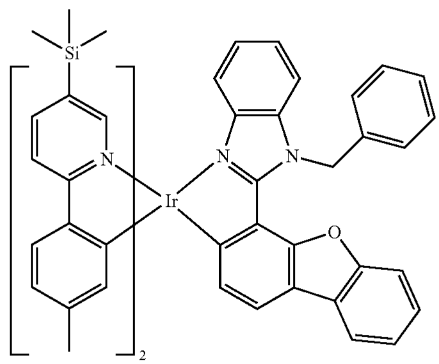
-continued
179
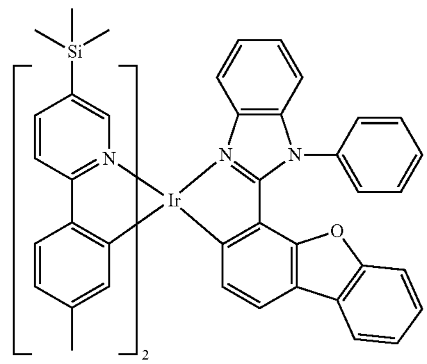
180
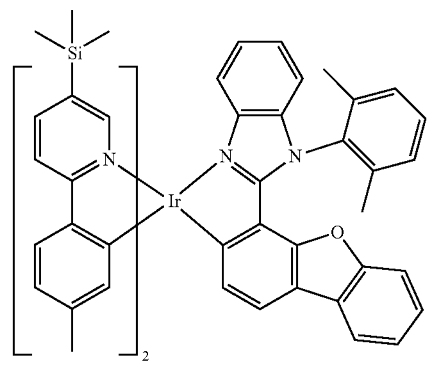
181
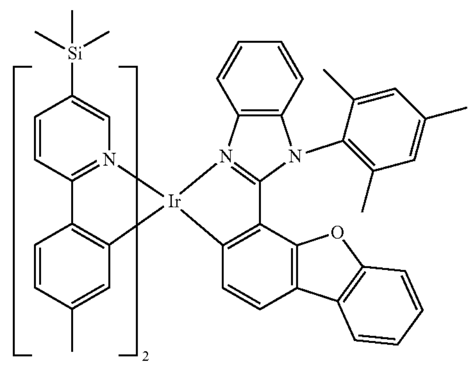
182
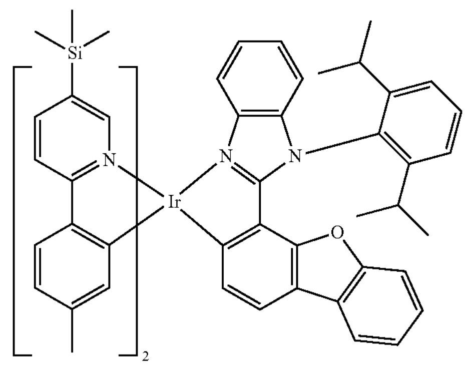

-continued
183
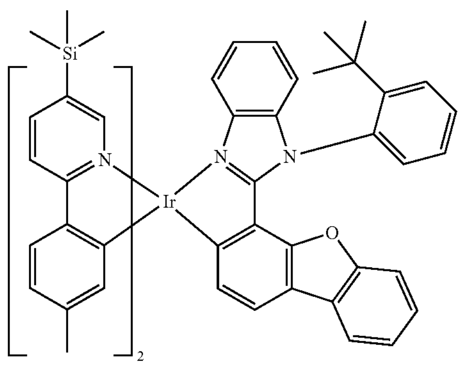
184
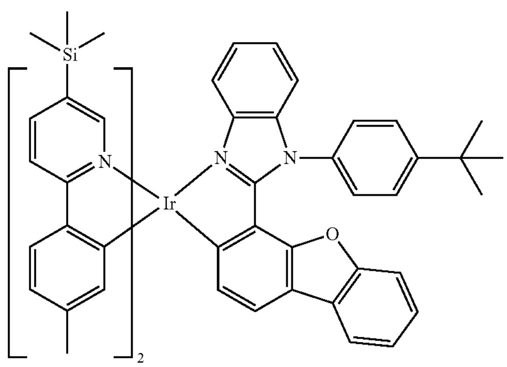
185
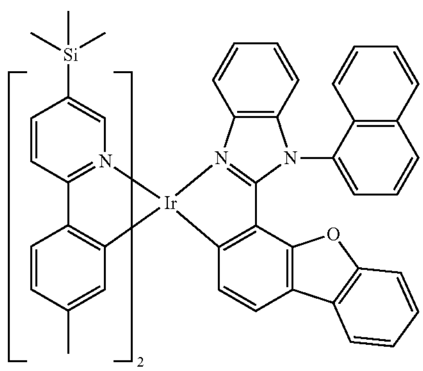
186
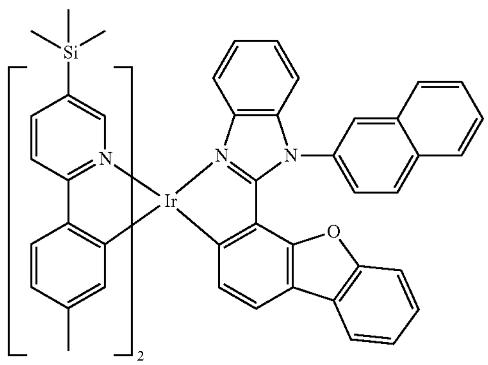
-continued
187
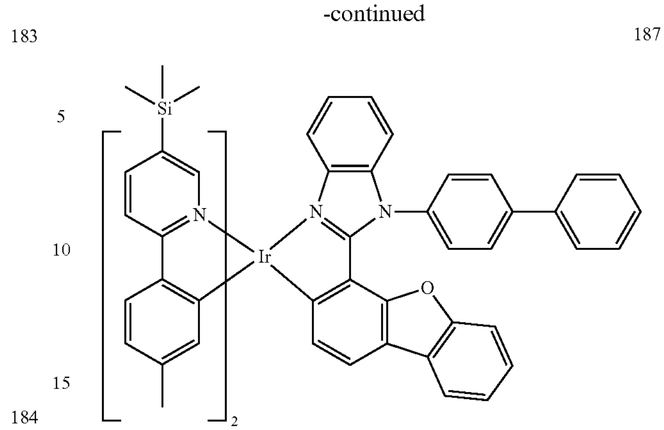
188
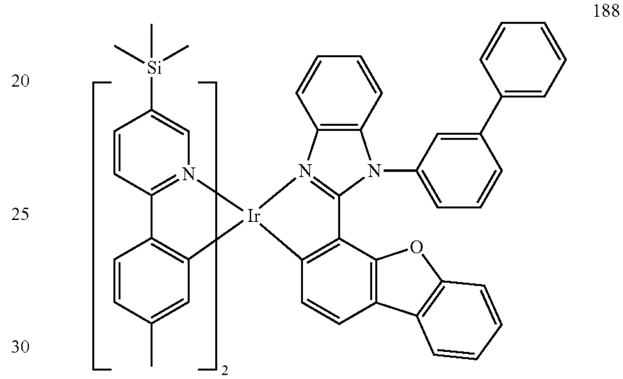
189
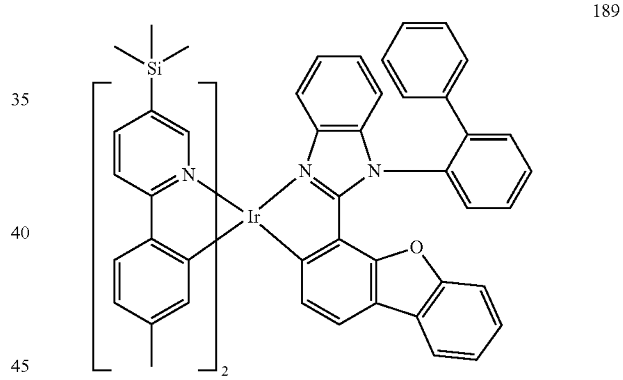
190
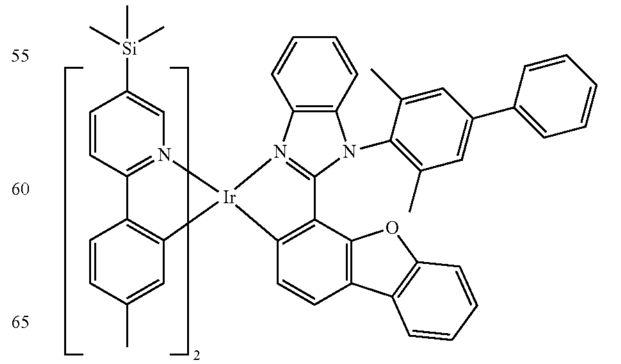

191
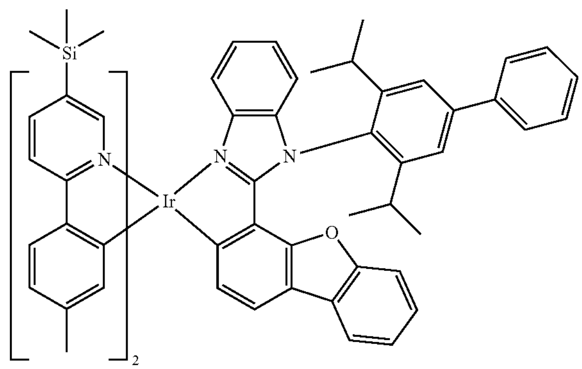
192
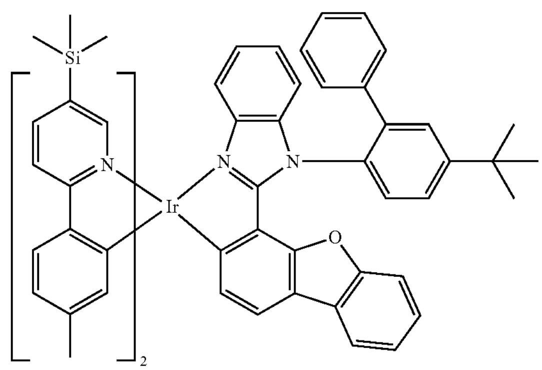
193
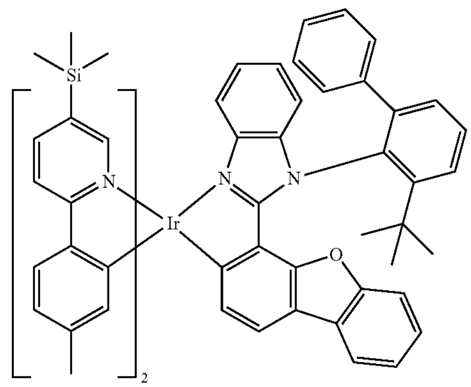
194
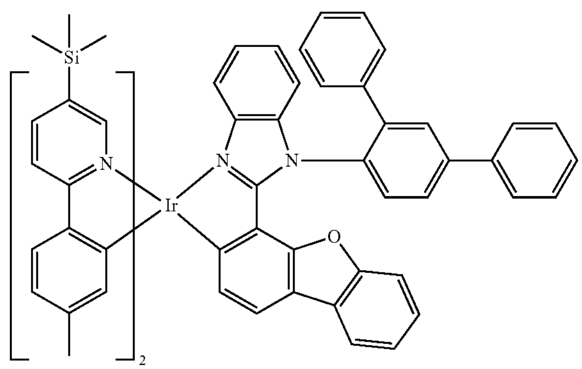
195
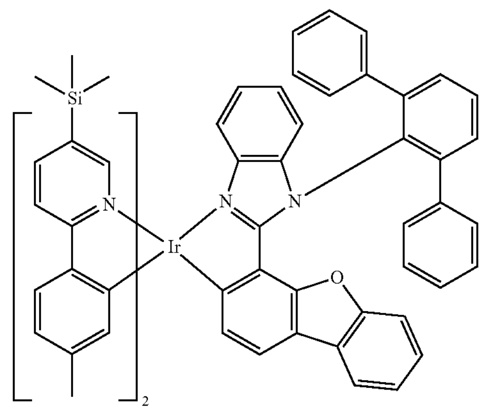
196
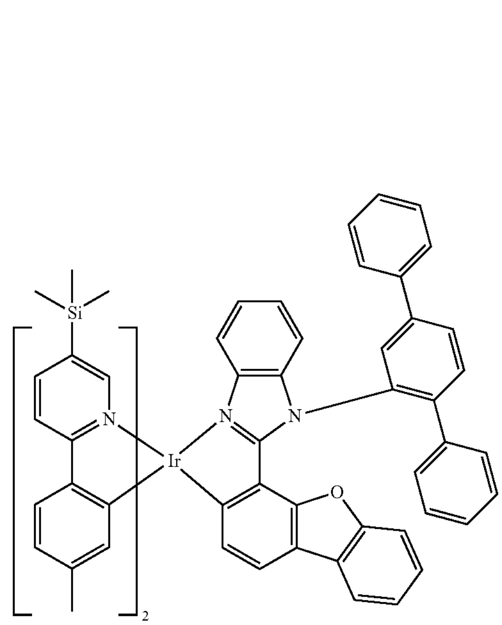
197
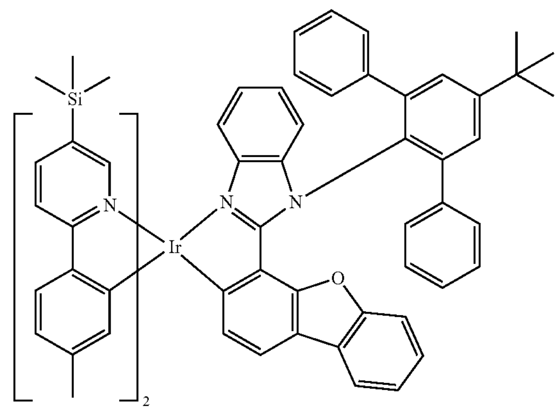

198
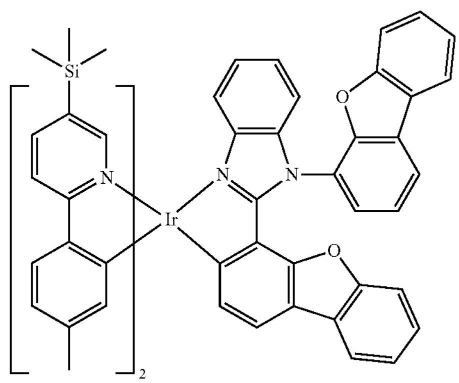
199
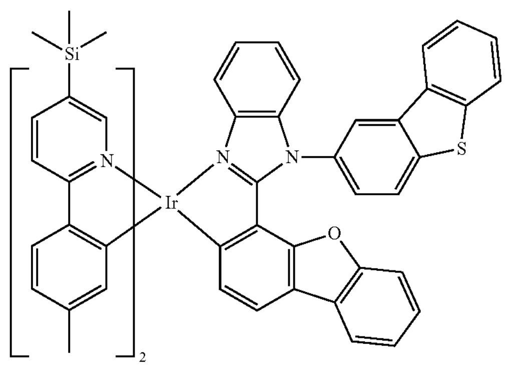
200
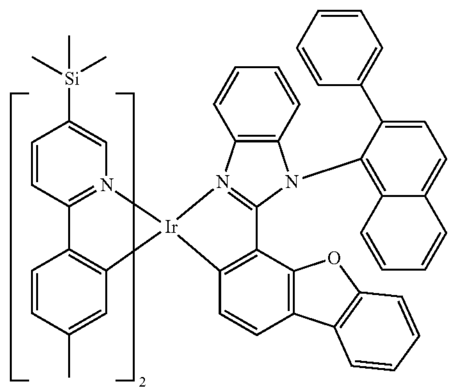
201
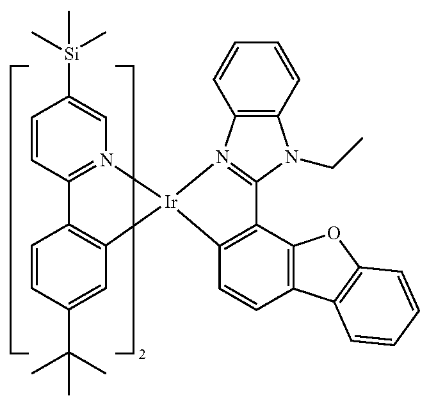
202
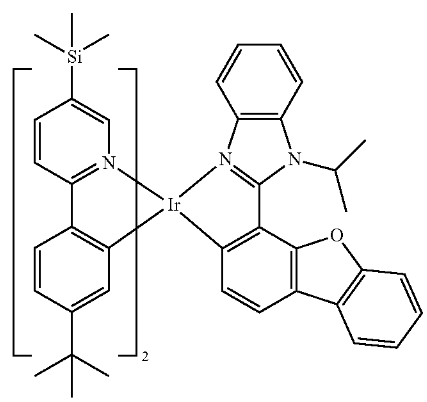
203
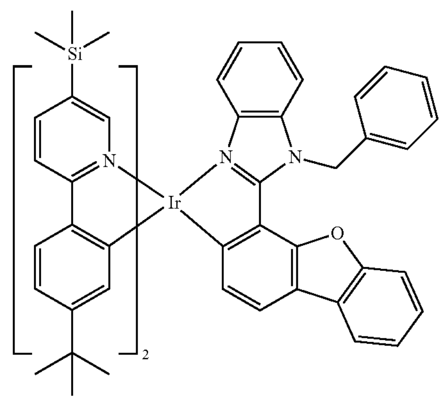
204
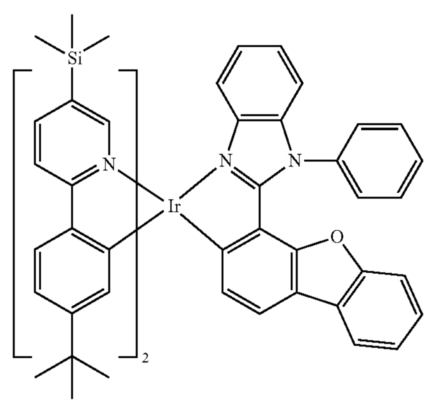
205
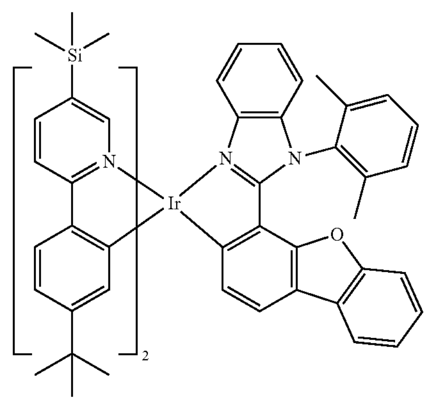

206
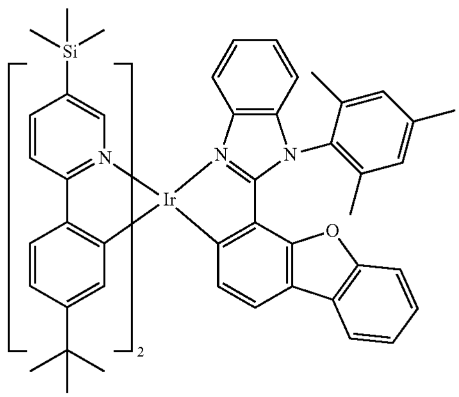
207
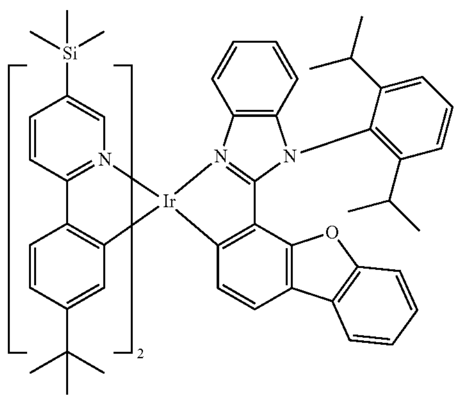
208
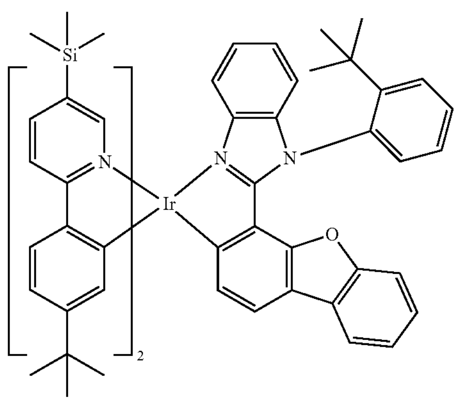
209
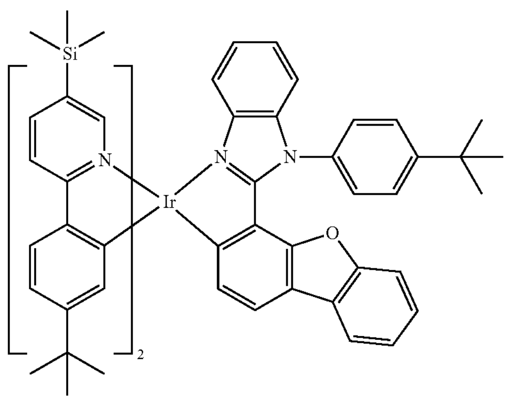
210
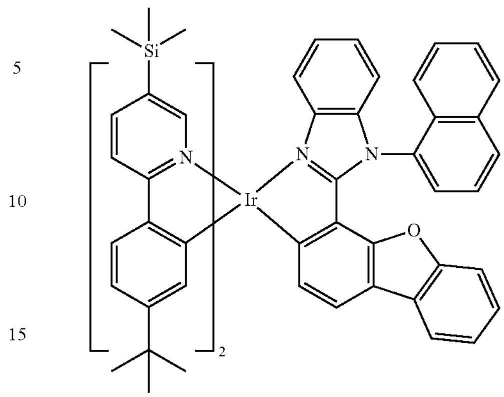
211
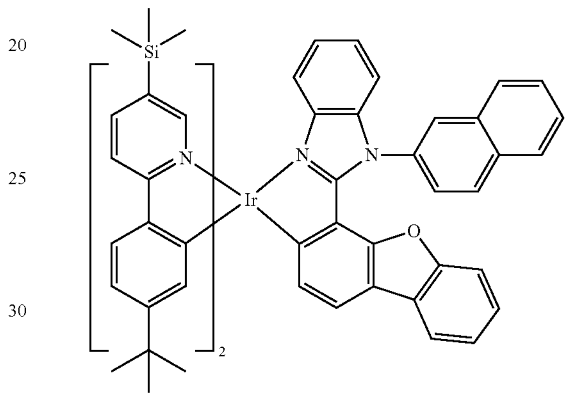
212
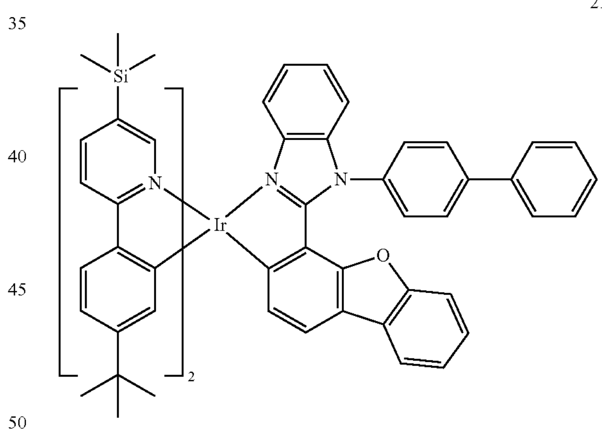
213
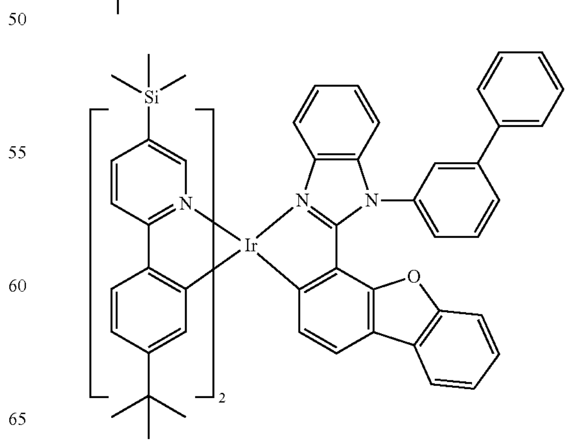

-continued
214
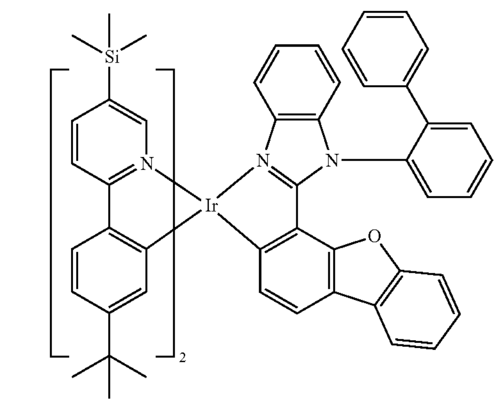
215
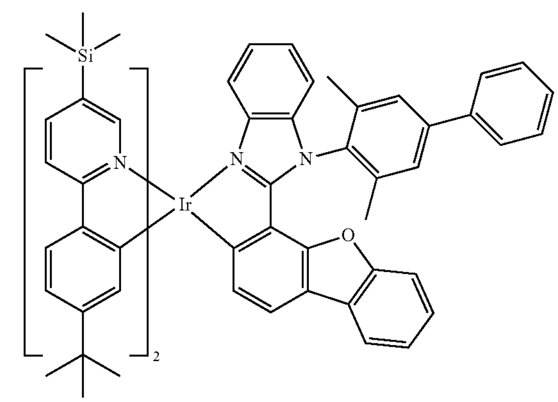
216
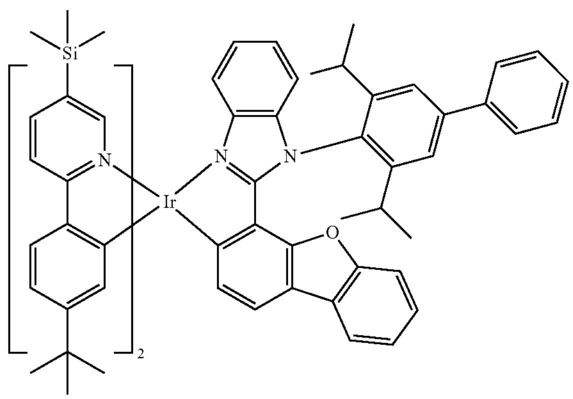
217
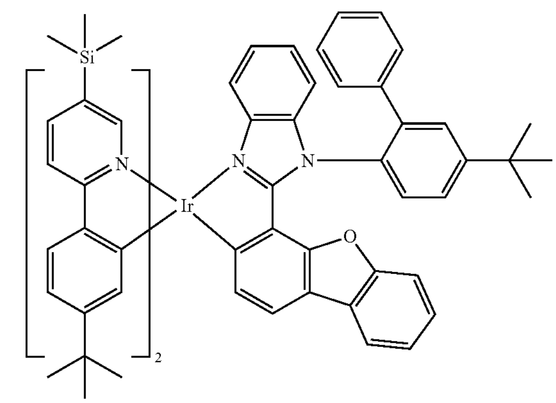
-continued
218
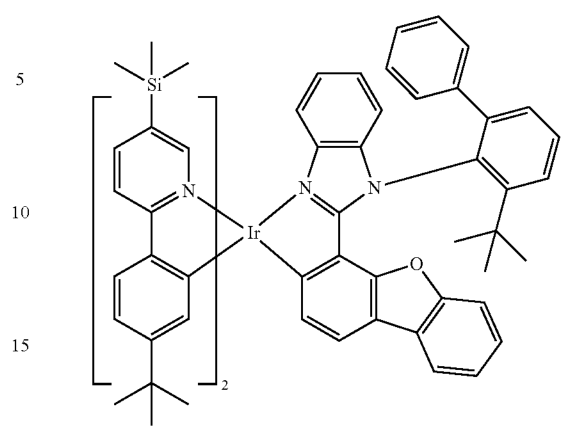
219
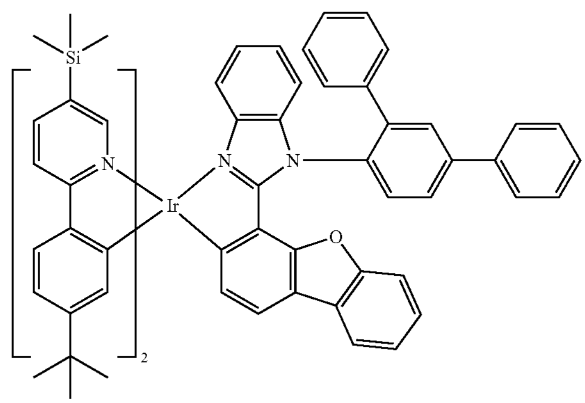
220
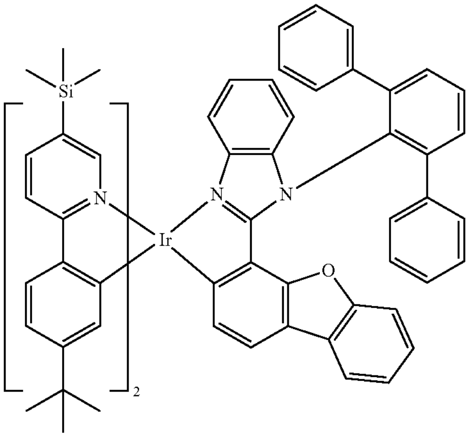

-continued
221
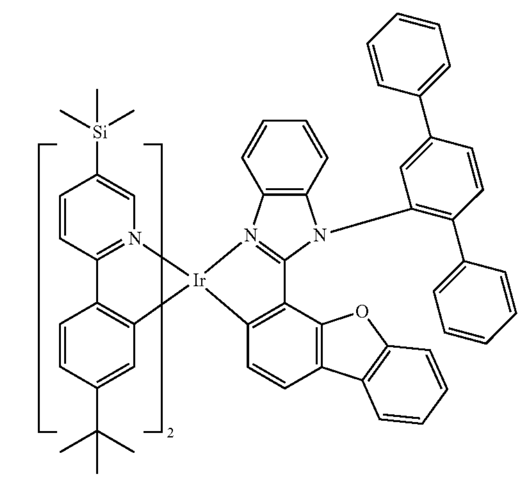
222
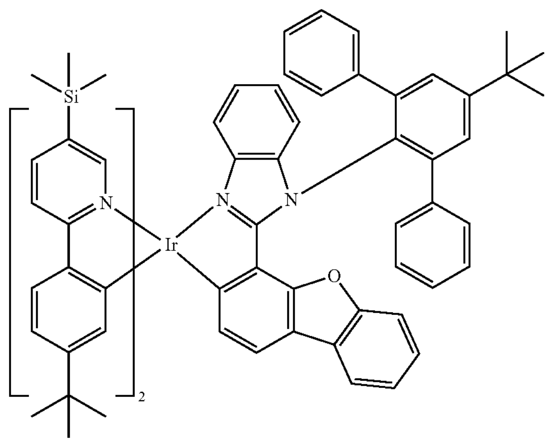
223
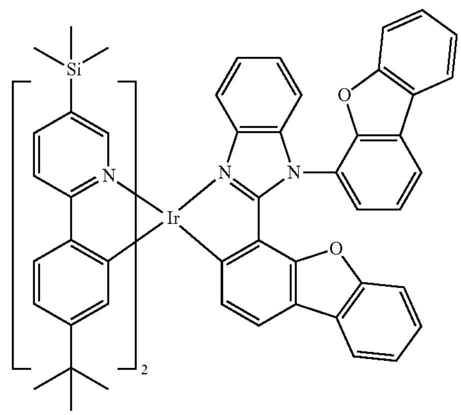
-continued
224
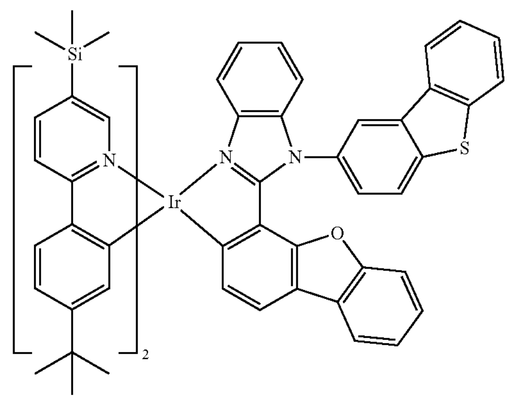
225
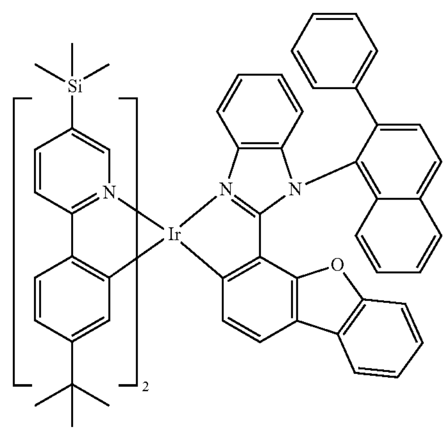
226
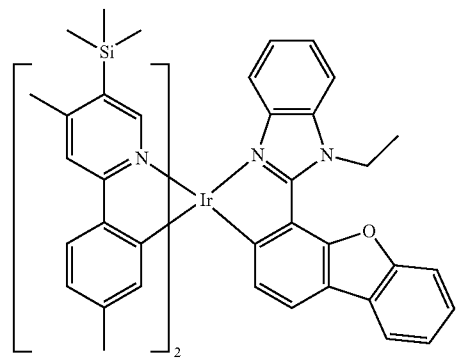
227
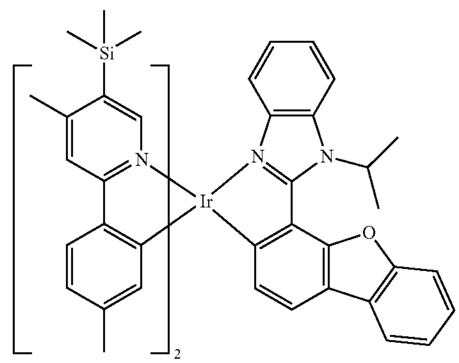

-continued
228
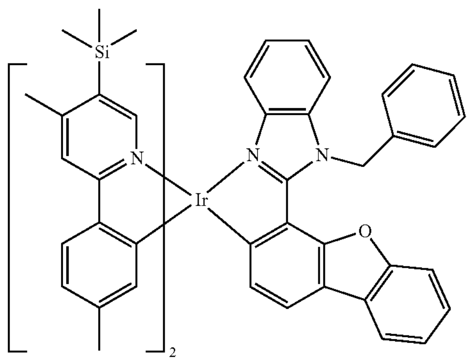
229
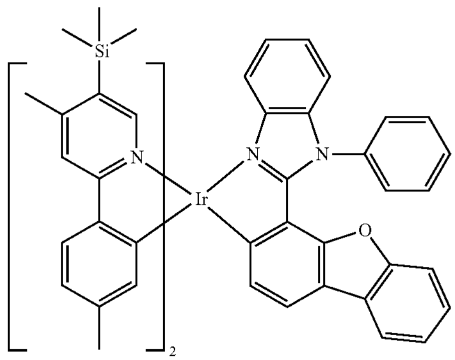
230
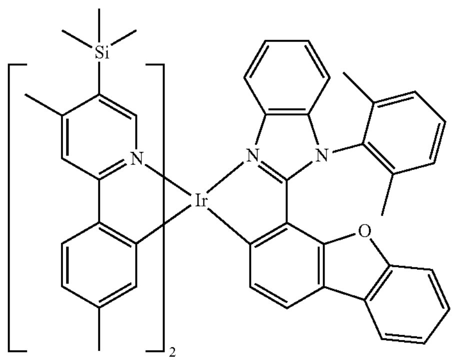
231
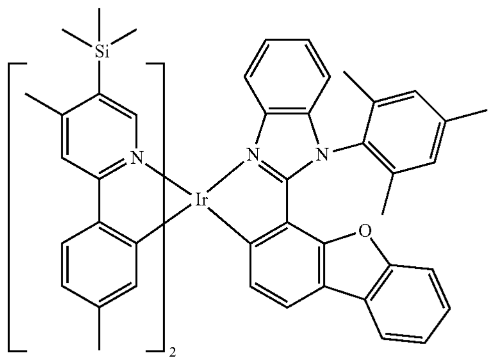
-continued
232
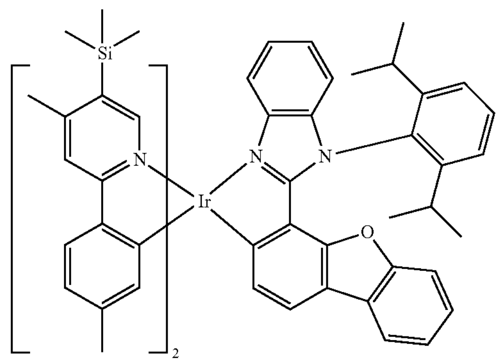
233
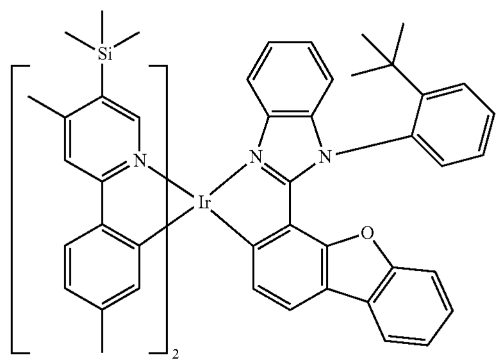
234
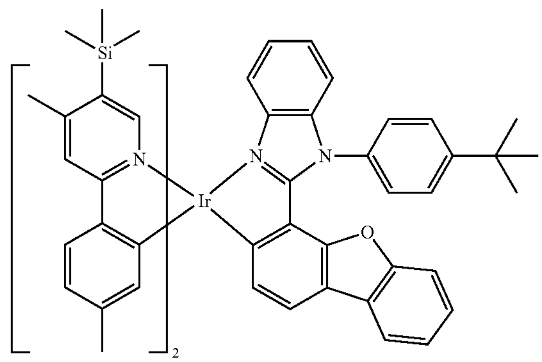
235
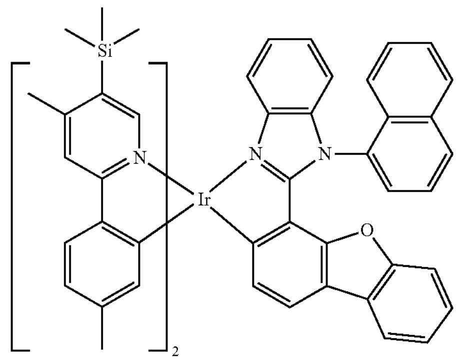

-continued
236
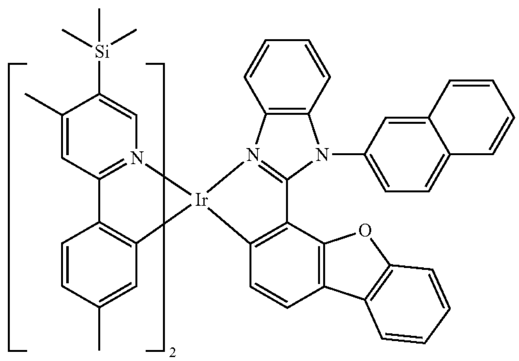
237
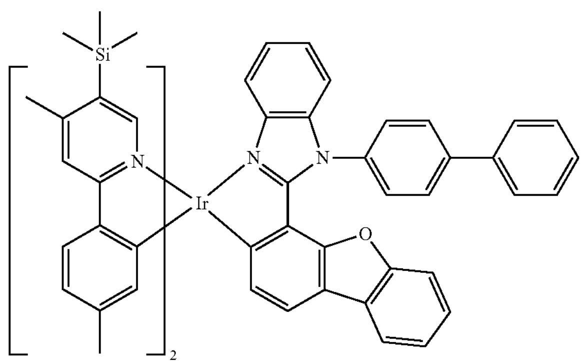
238
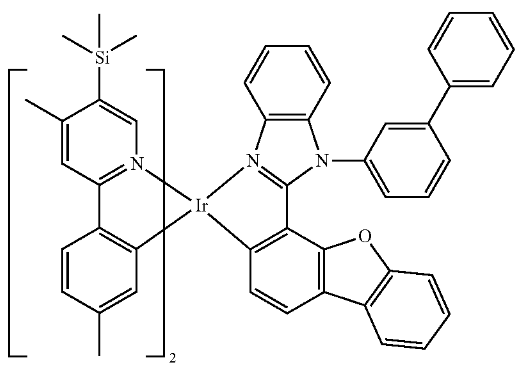
239
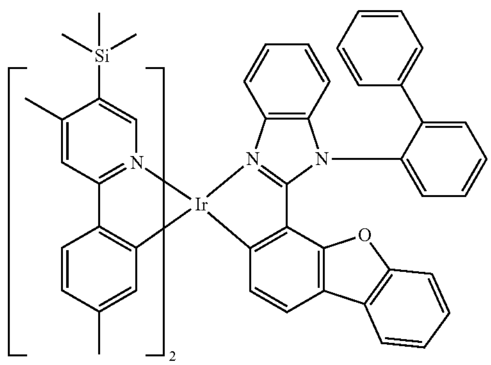
-continued
240
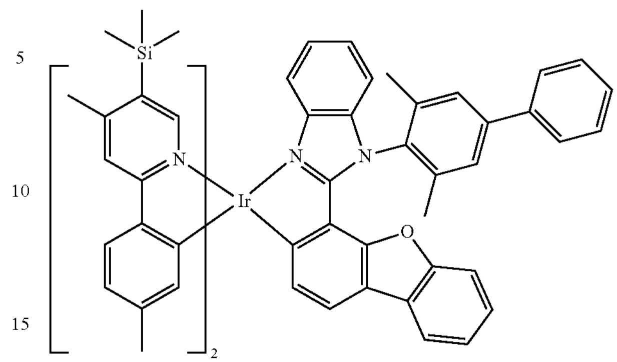
241
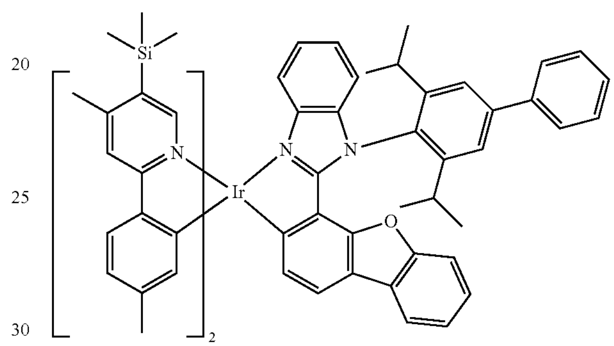
242
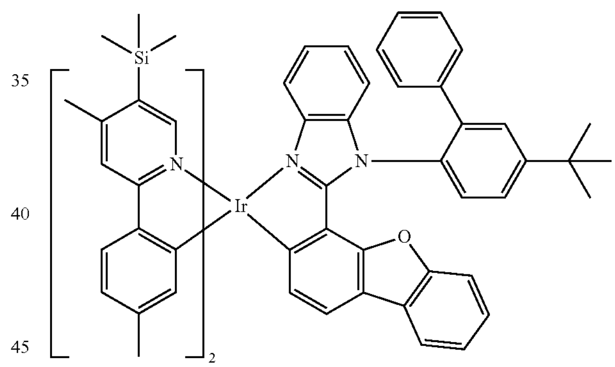
243
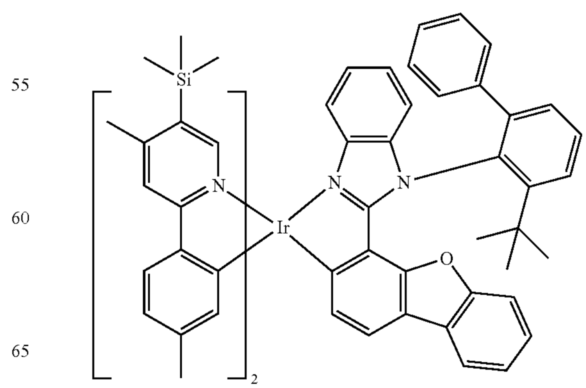

-continued
244
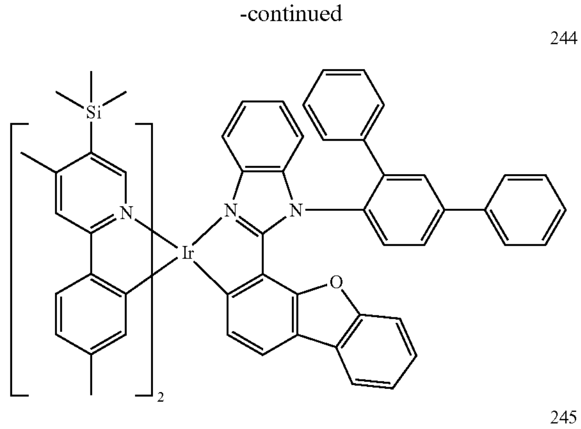
245
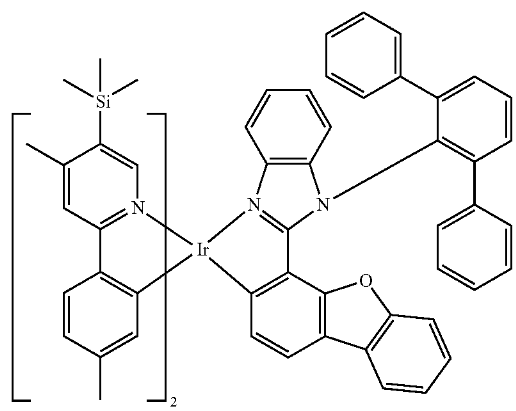
246
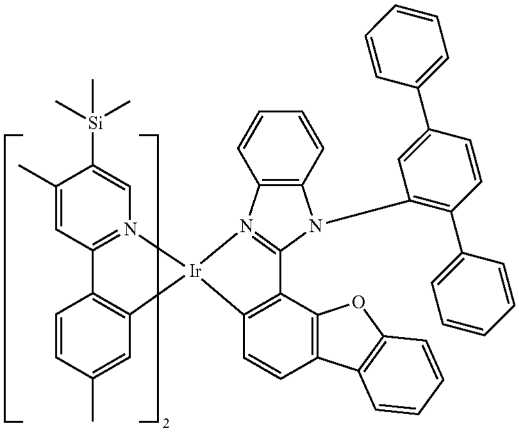
247
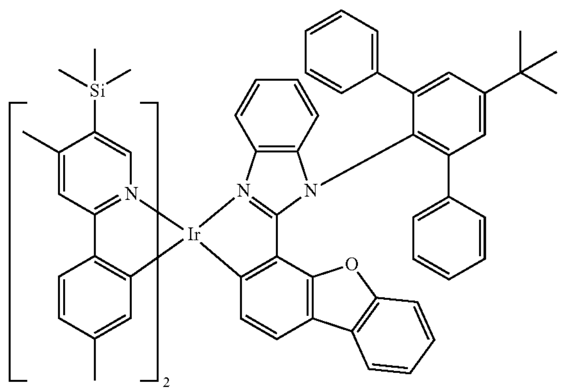
-continued
248
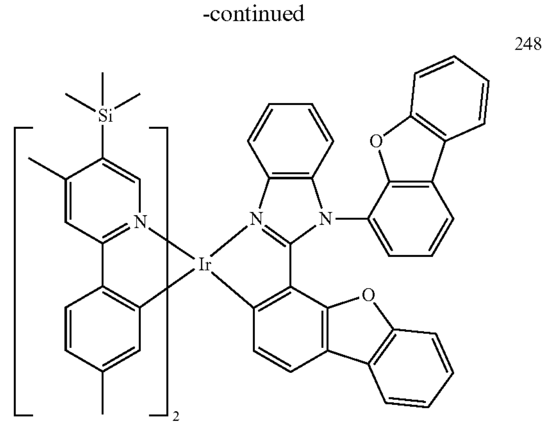
249
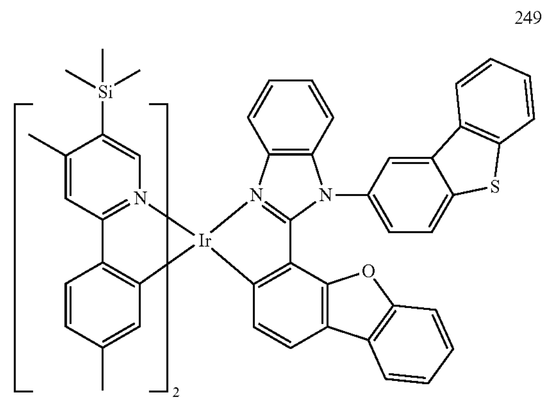
250
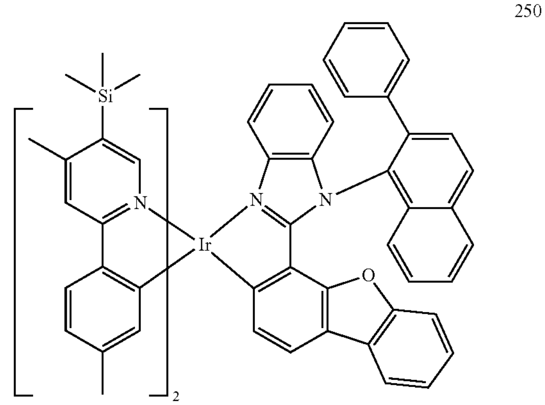
251
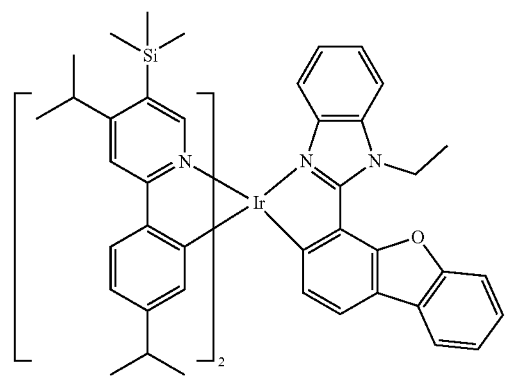

252
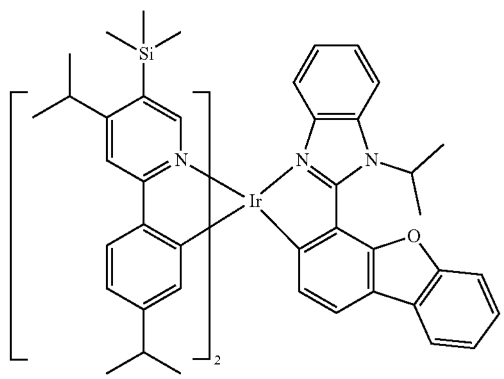
253
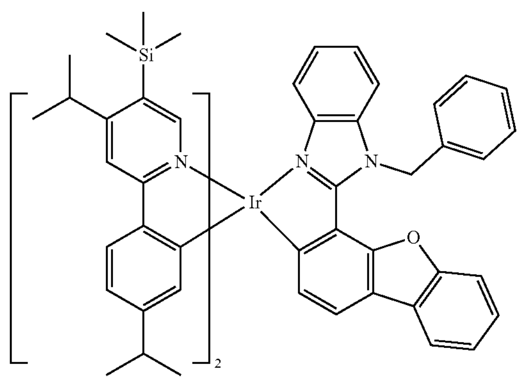
254
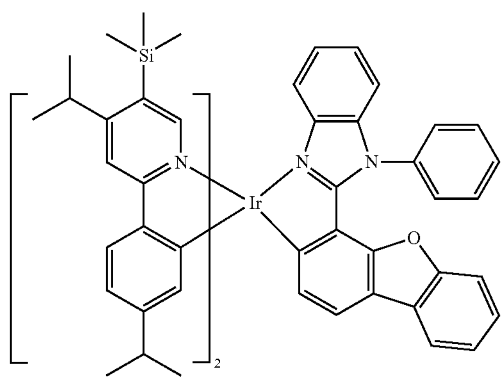
255
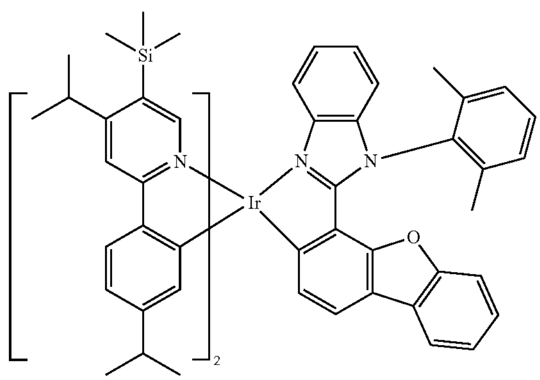
256
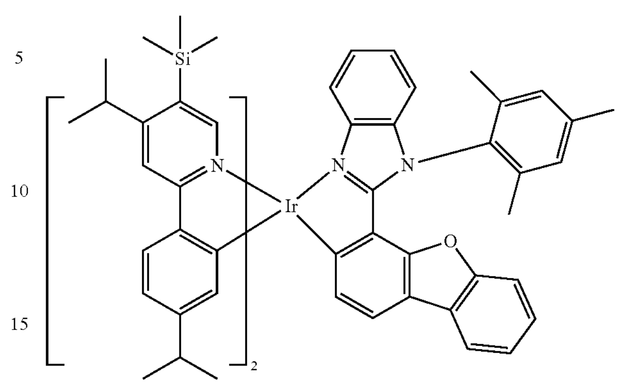
257
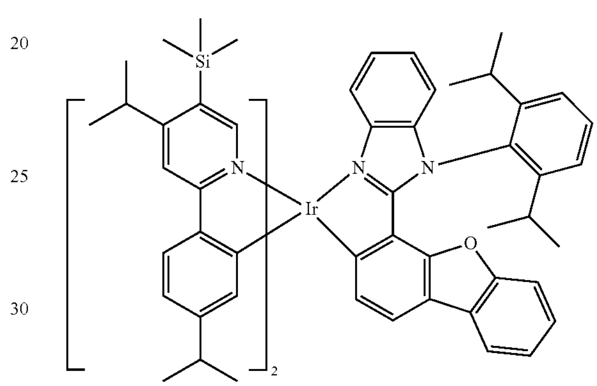
258
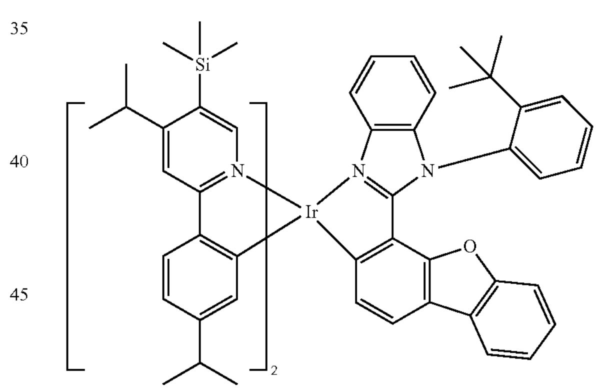
259
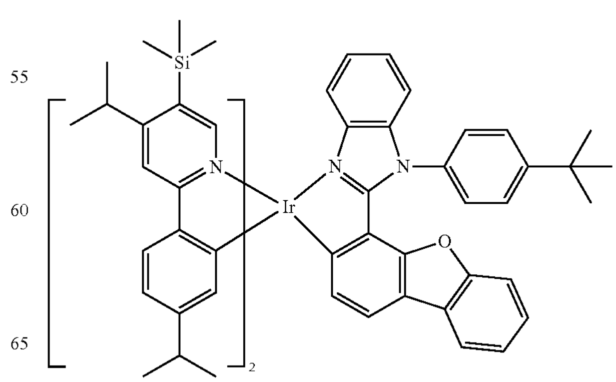

-continued
260
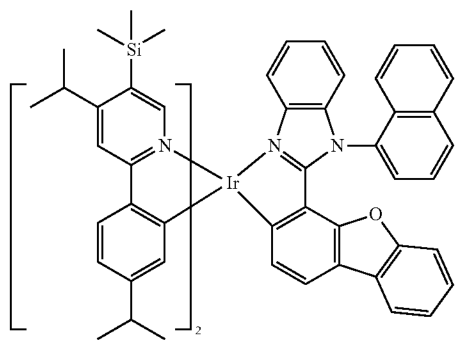
261
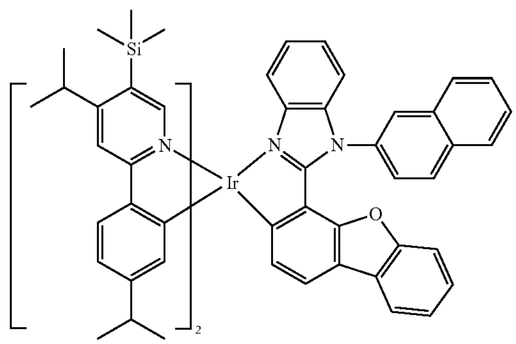
262
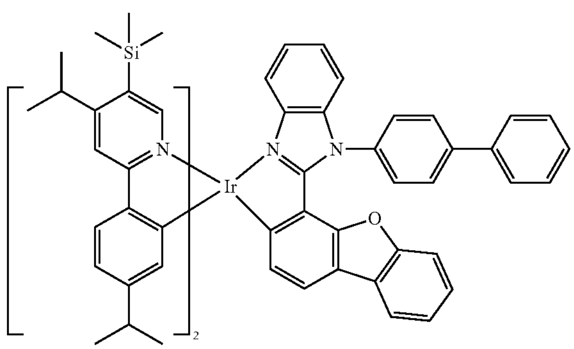
263
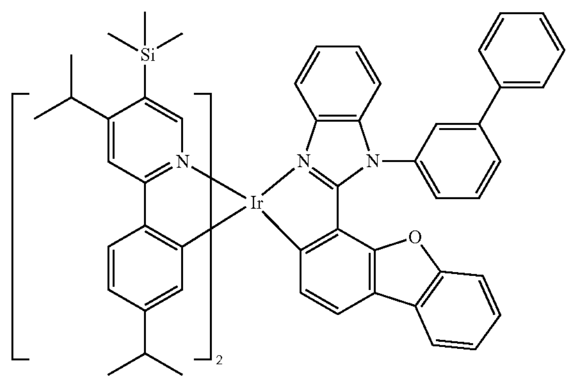
-continued
264
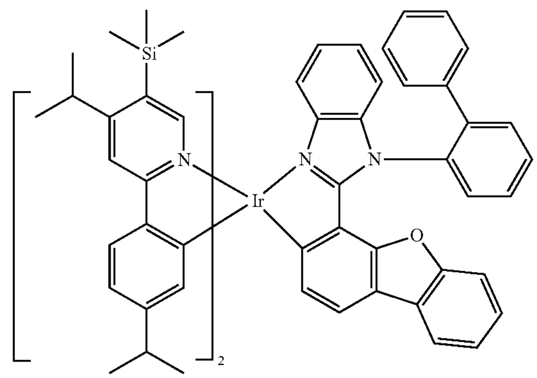
265
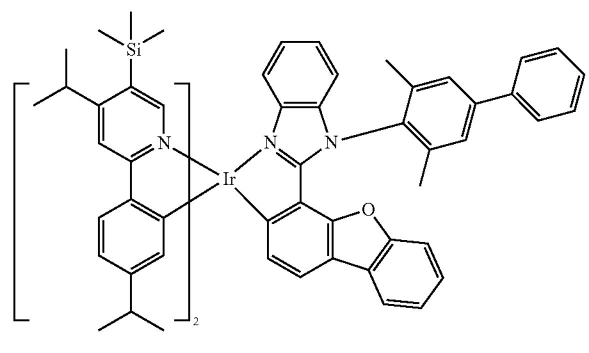
266
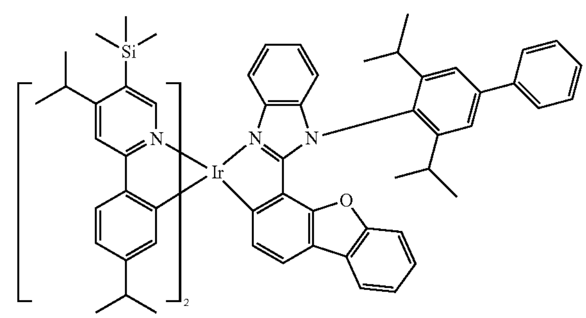
267
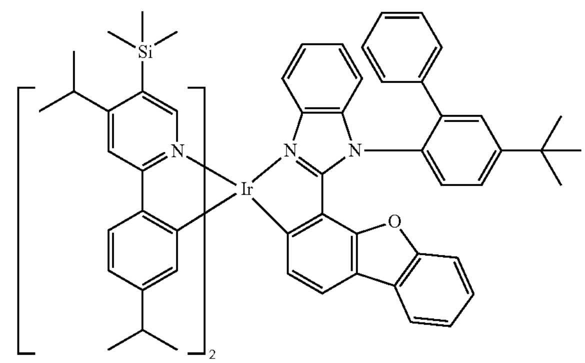

-continued
268
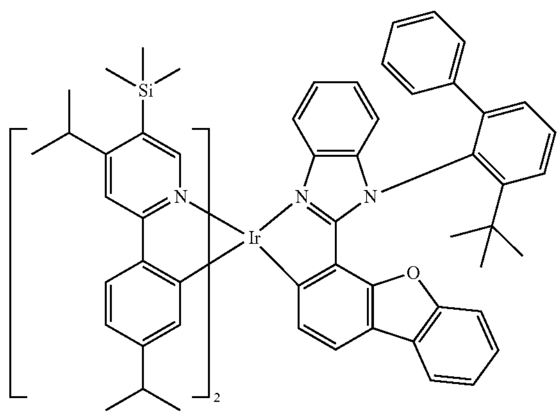
269
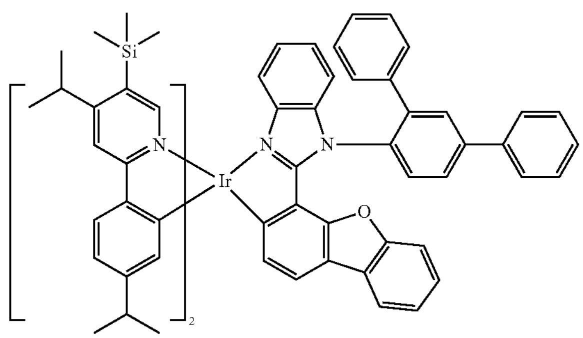
270
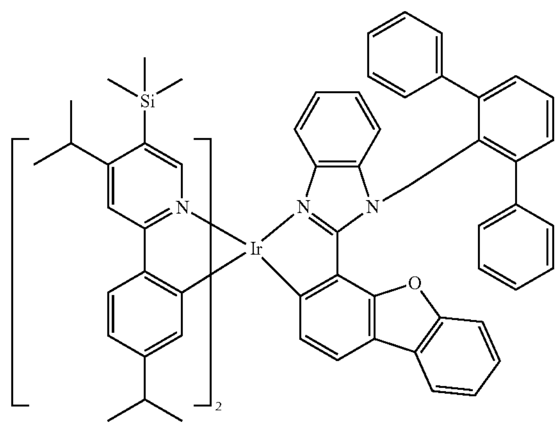
-continued
271
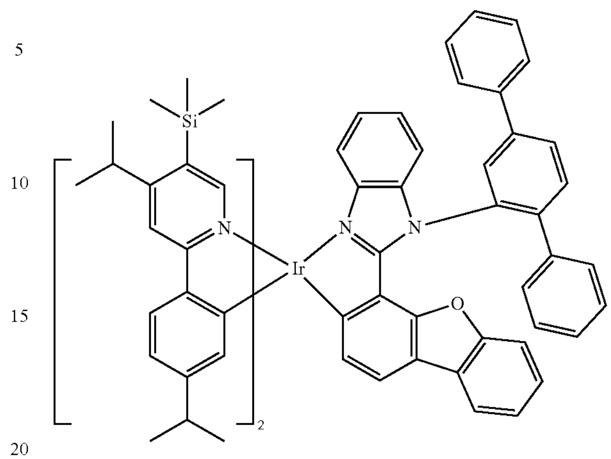
272
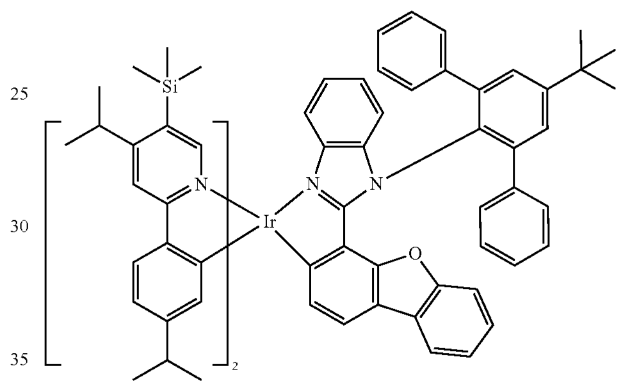
273
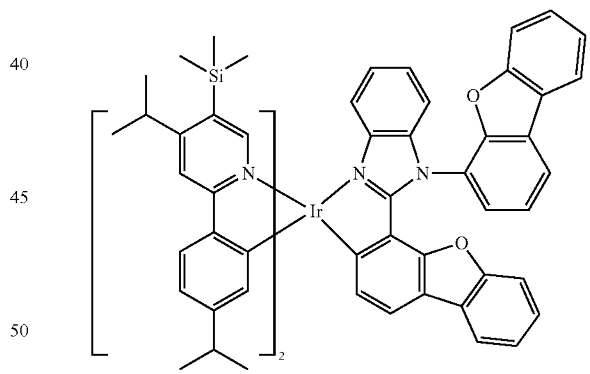
274
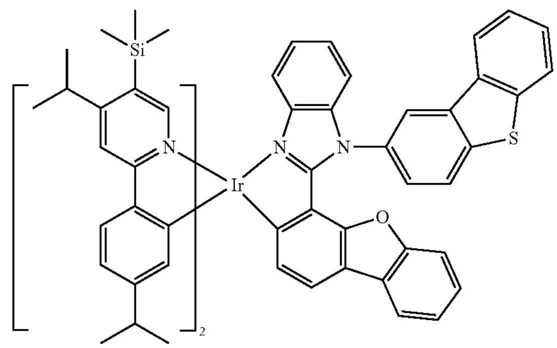

-continued
275
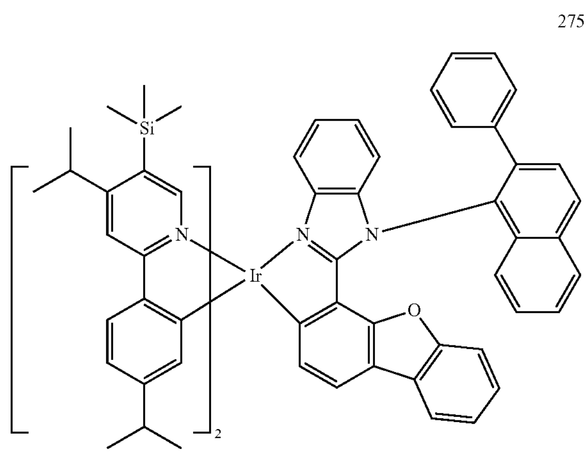
276
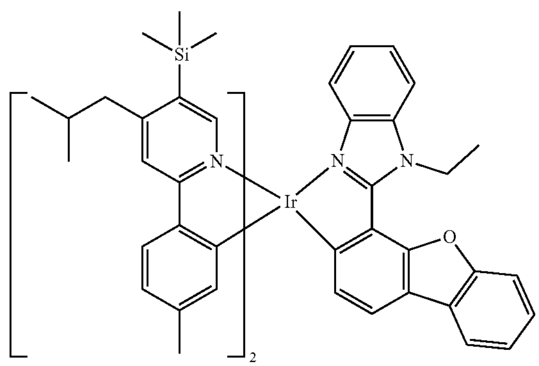
277
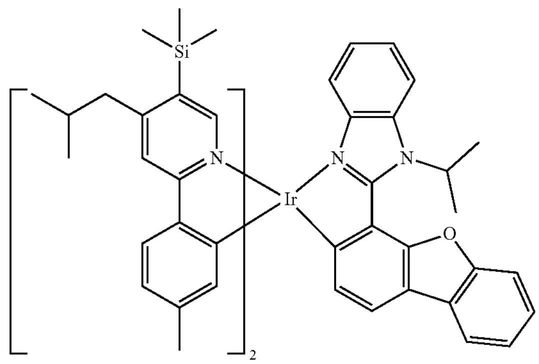
278
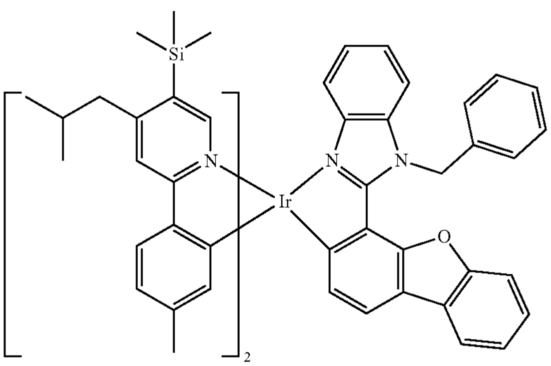
-continued
279
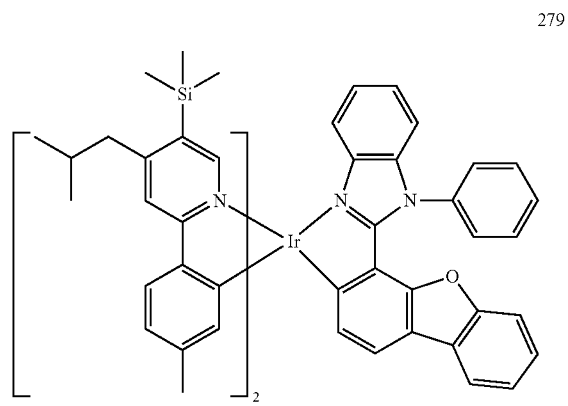
280
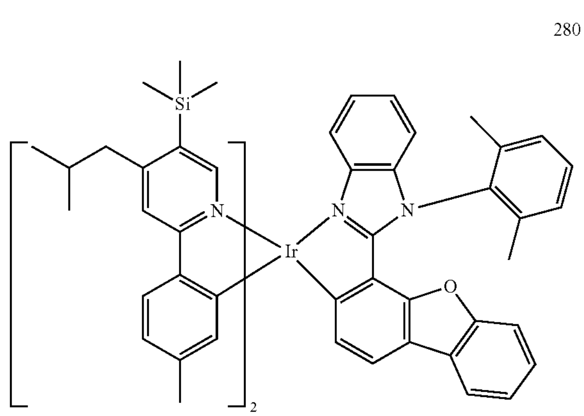
281
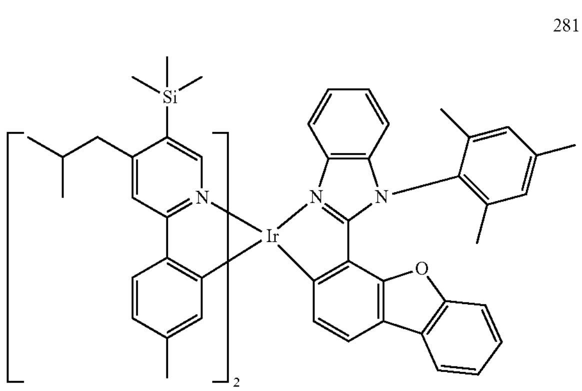
282
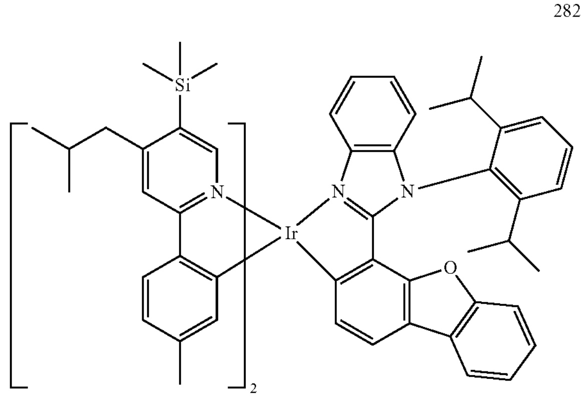

283
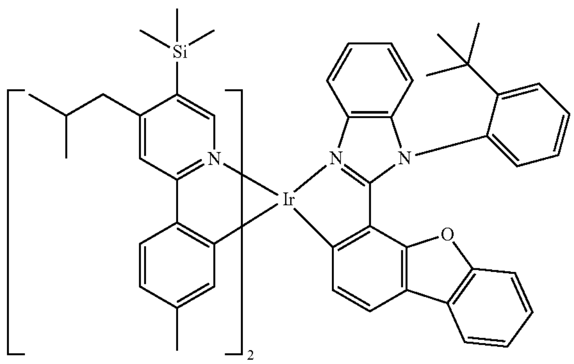
284
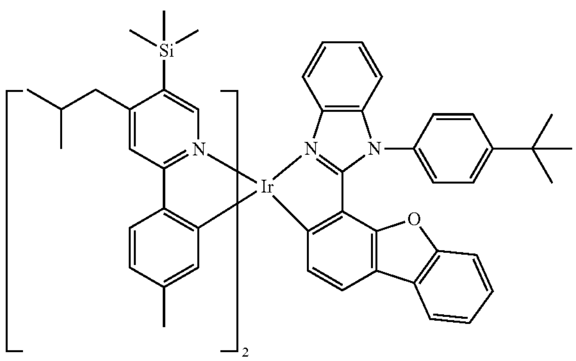
285
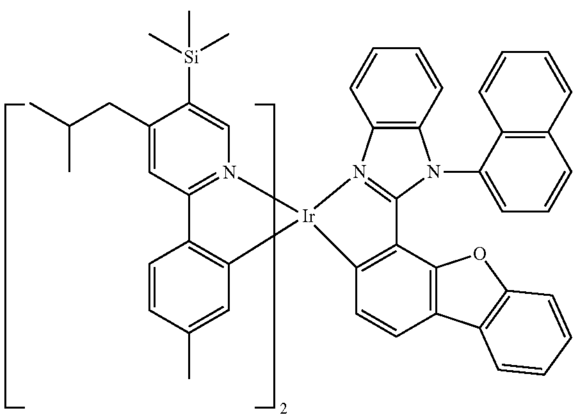
286
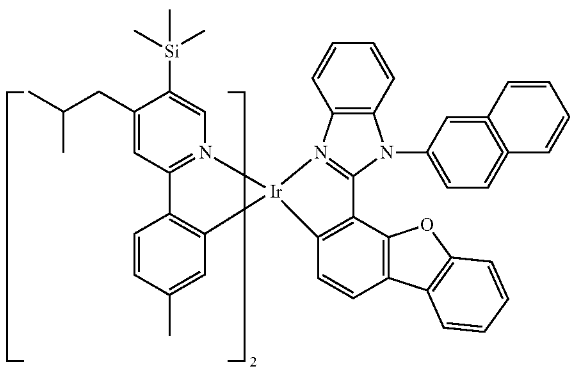
287
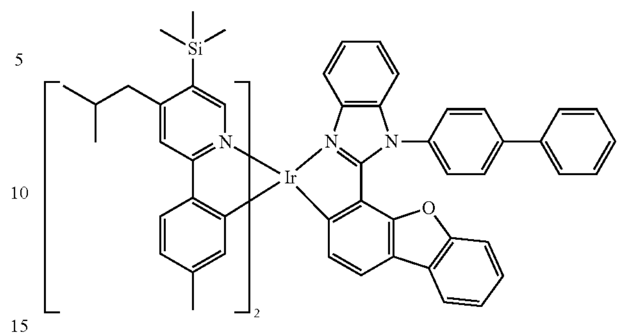
288
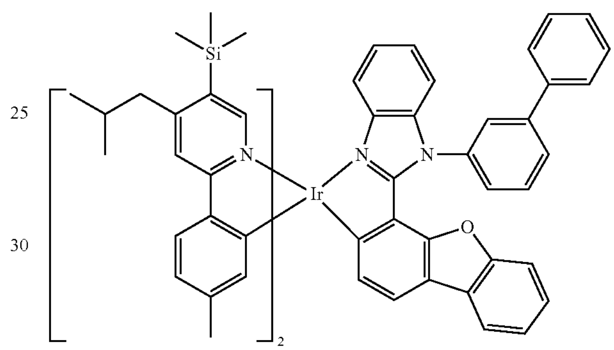
289
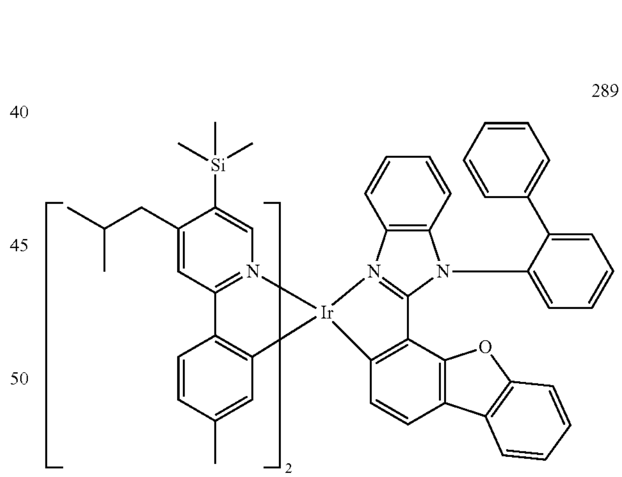
290
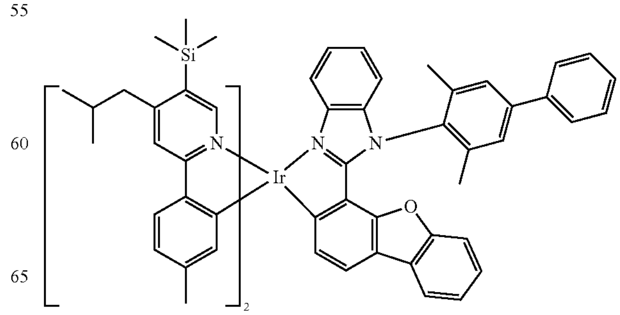

-continued
291
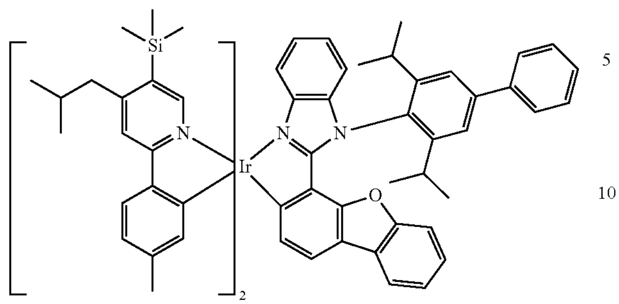
292
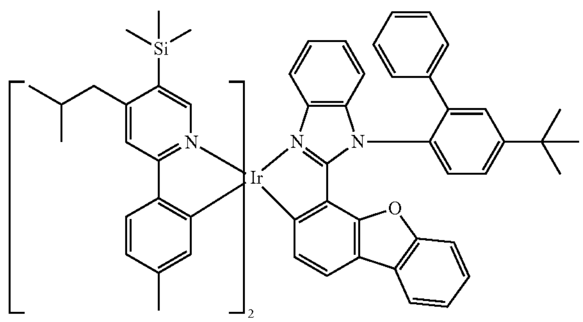
293
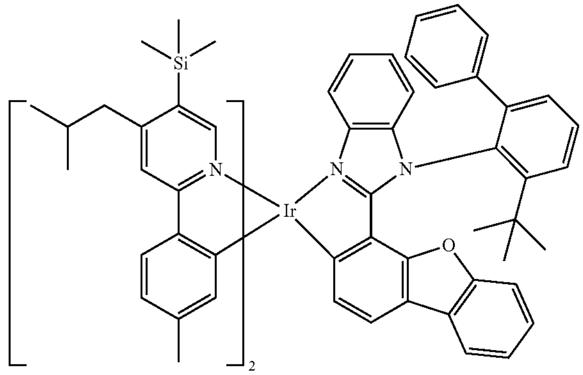
294
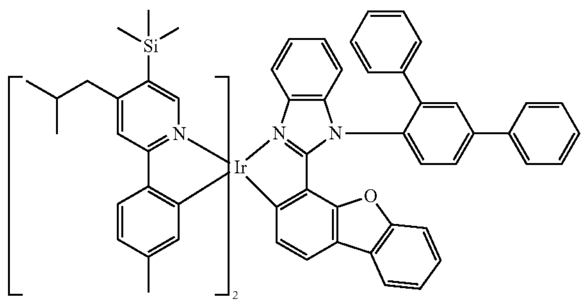
-continued
295
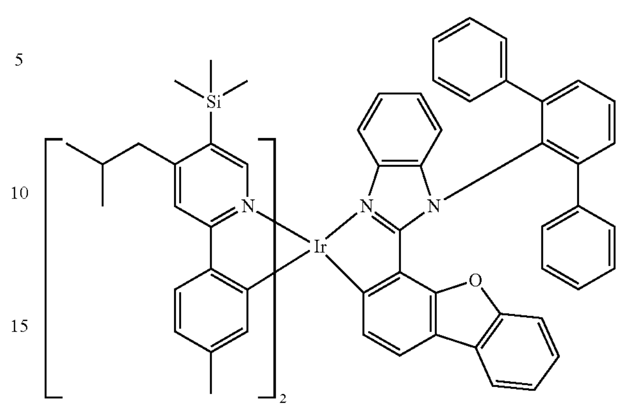
296
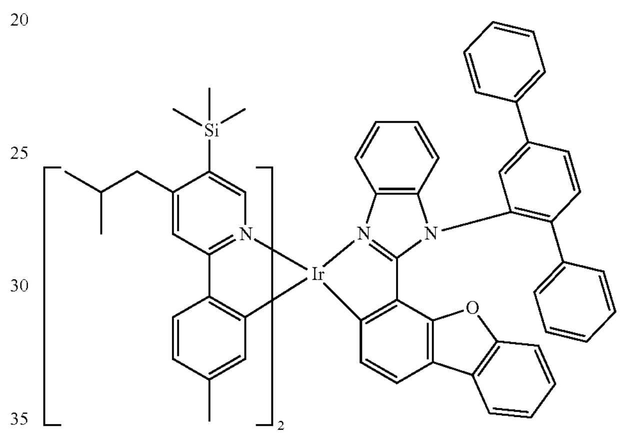
297
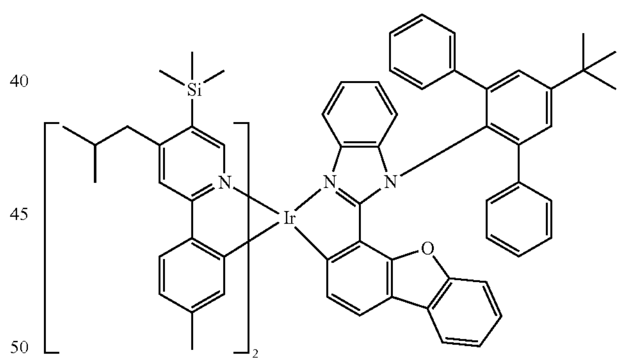
298
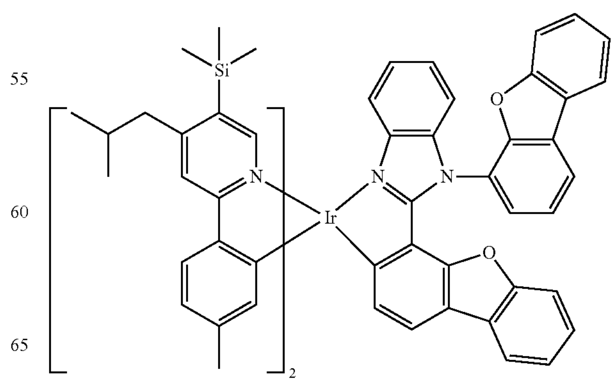

-continued
299
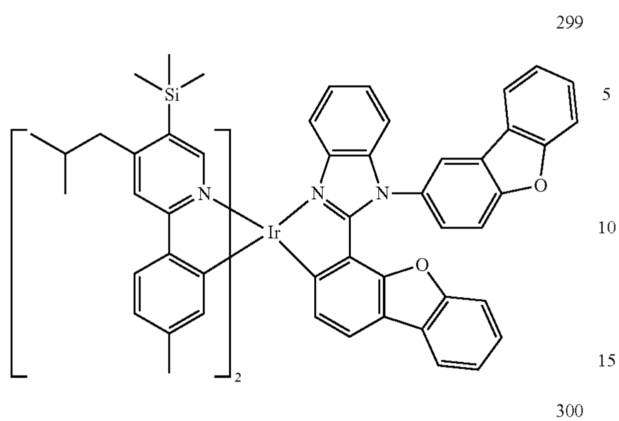
300
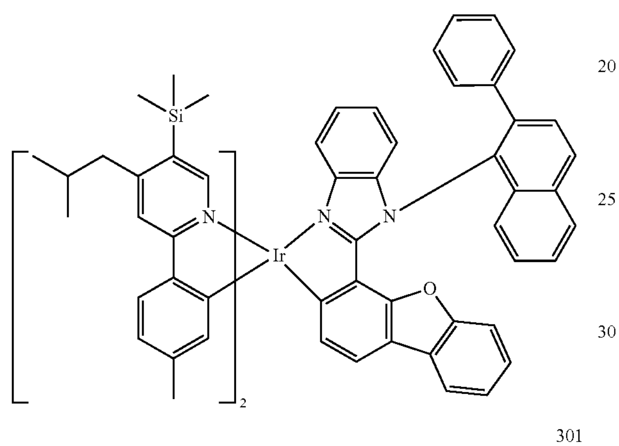
301
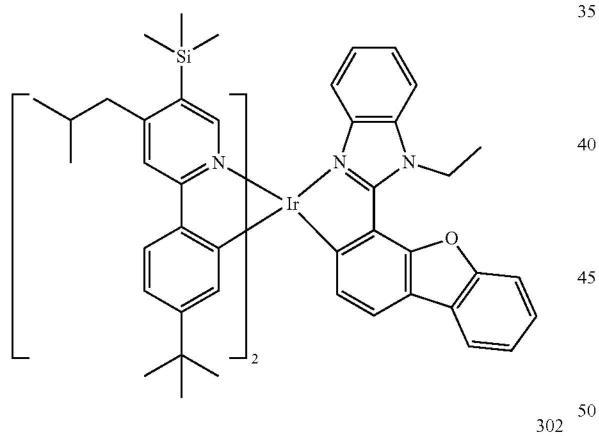
302
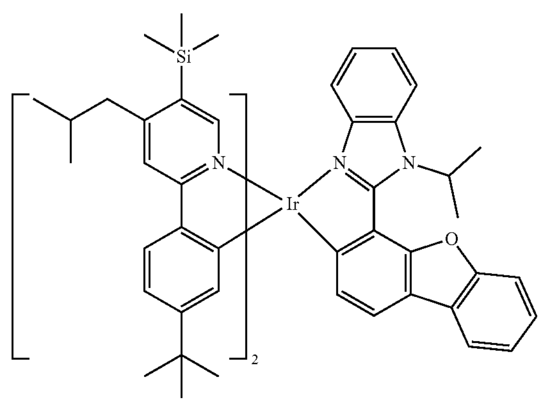
-continued
303
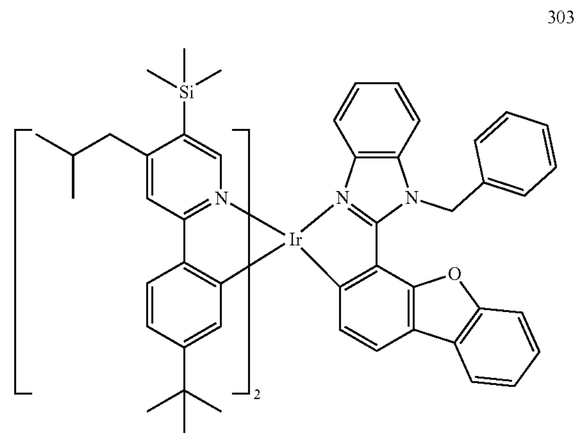
304
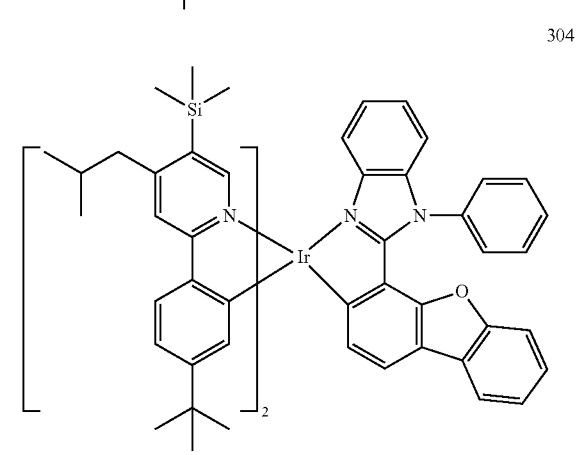
305
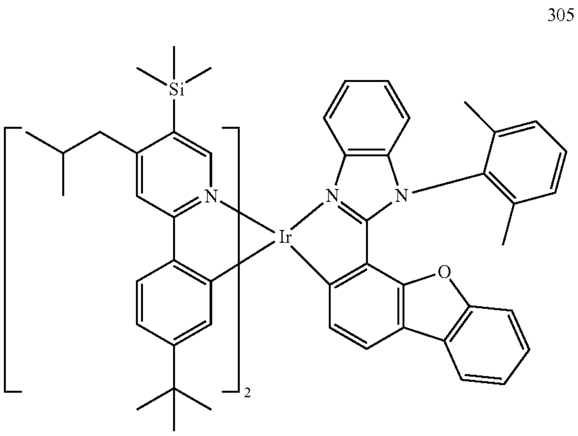
306
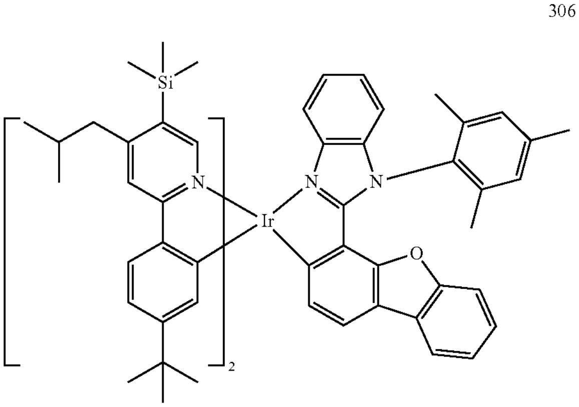

-continued
307
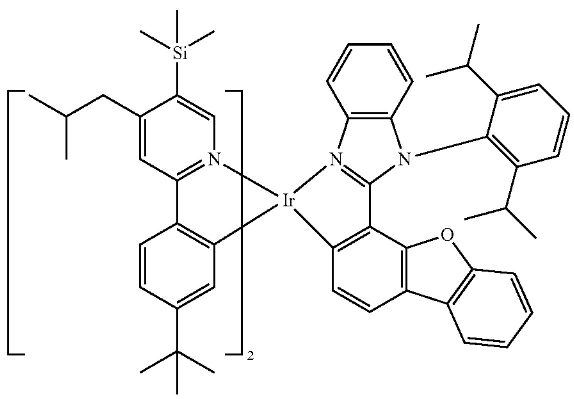
308
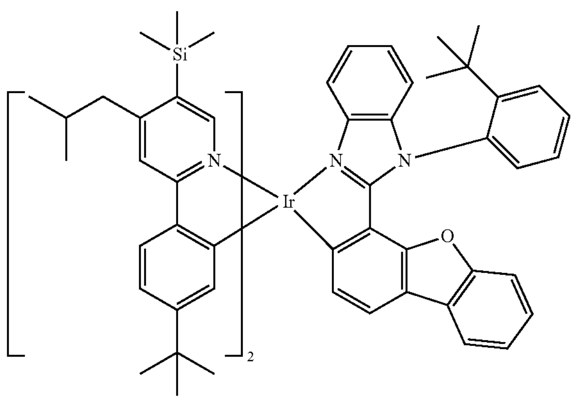
309
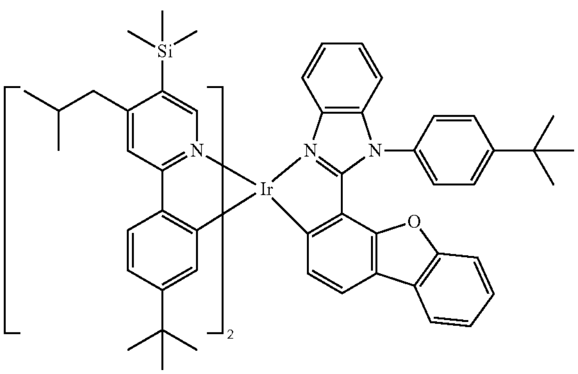
-continued
310
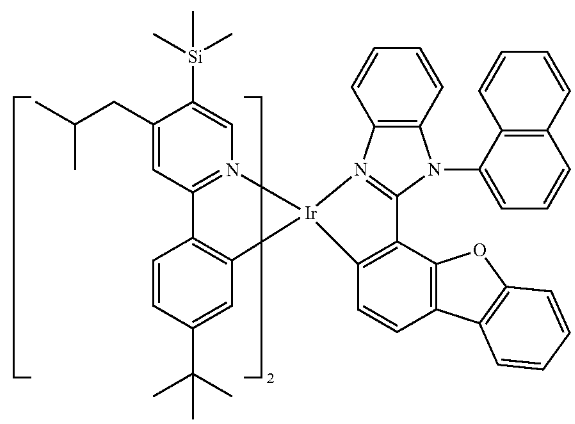
311
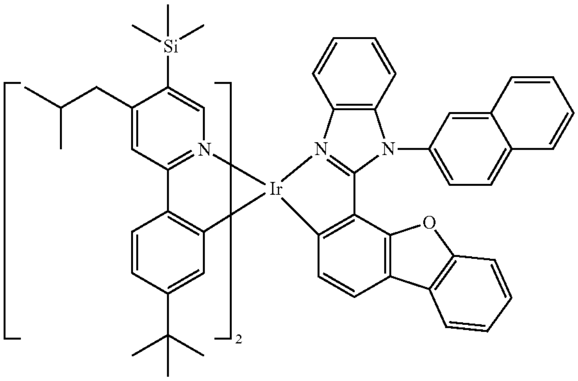
312
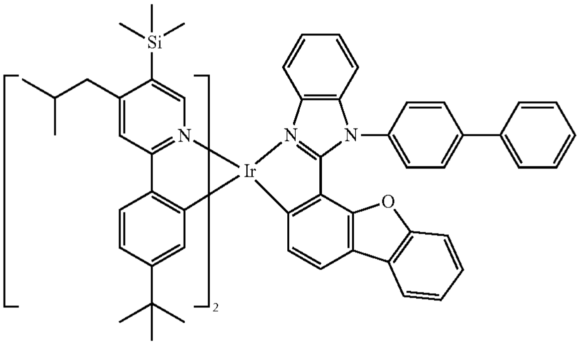
313
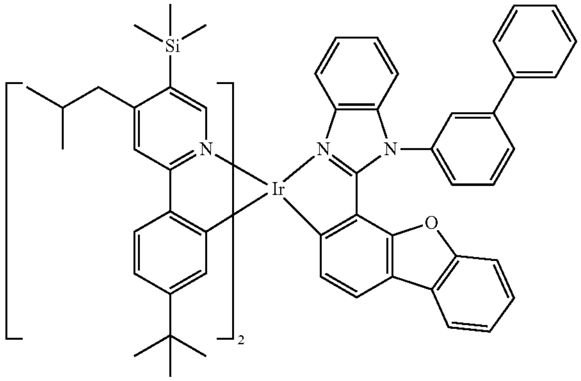

-continued
314
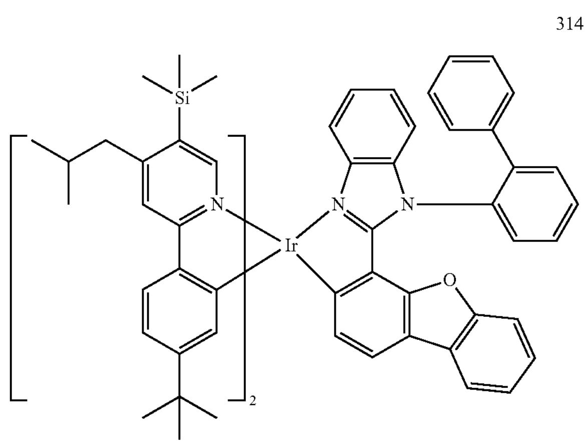
315
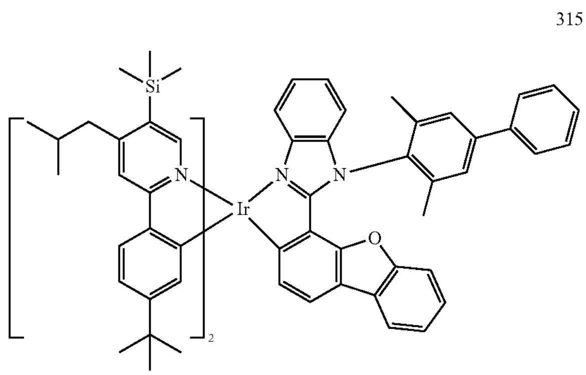
316
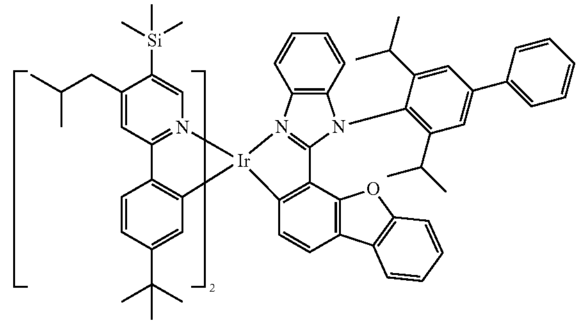
317
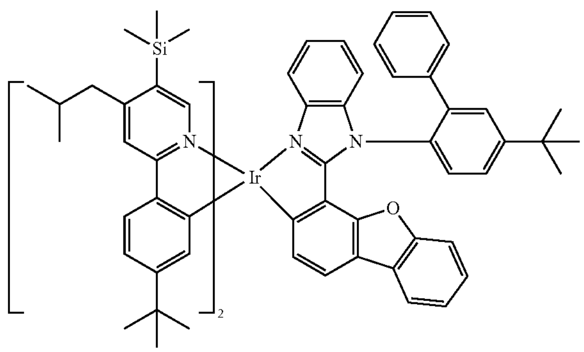
-continued
318
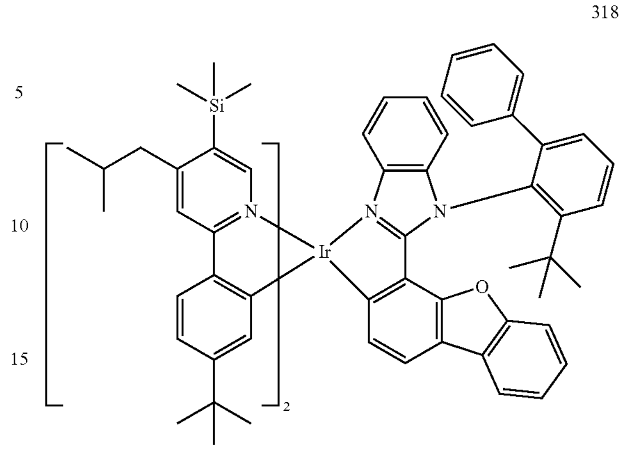
319
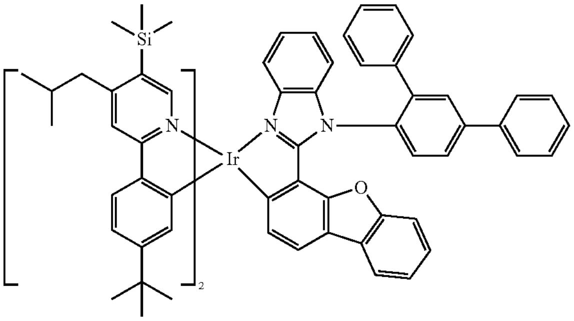
320
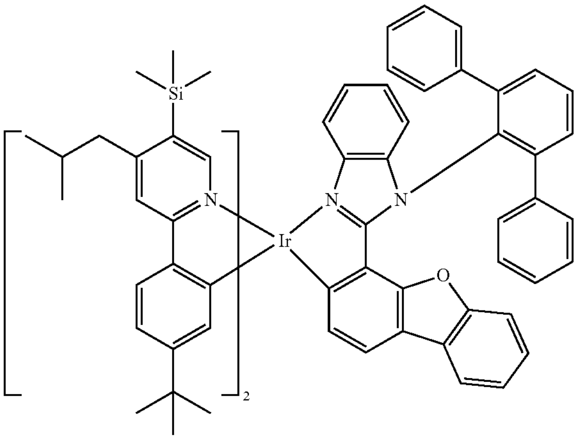

-continued
321
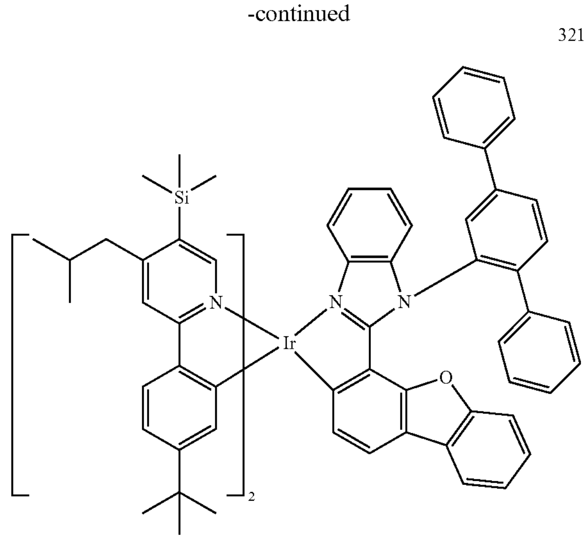
322
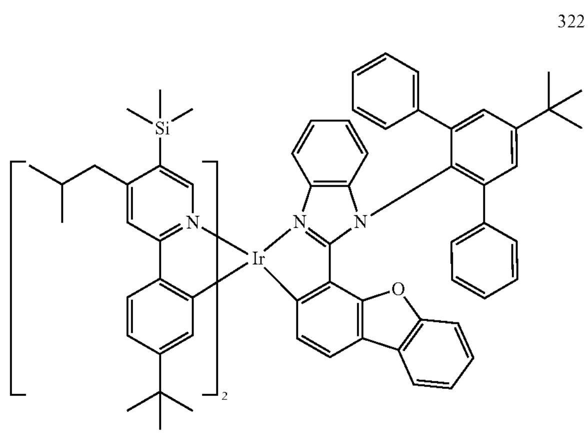
323
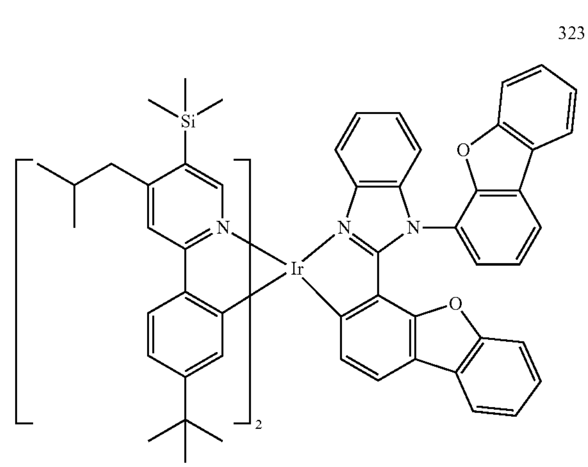
-continued
324
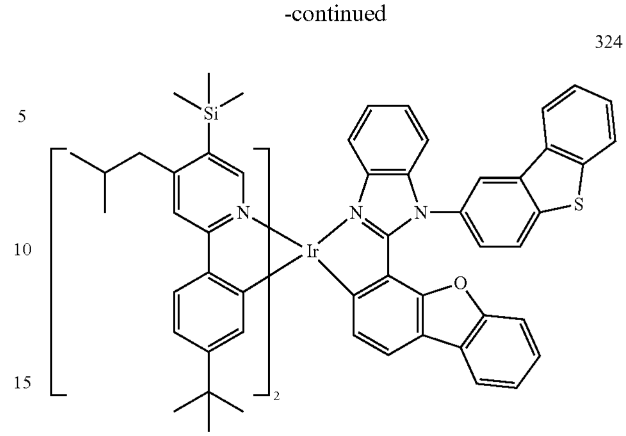
325
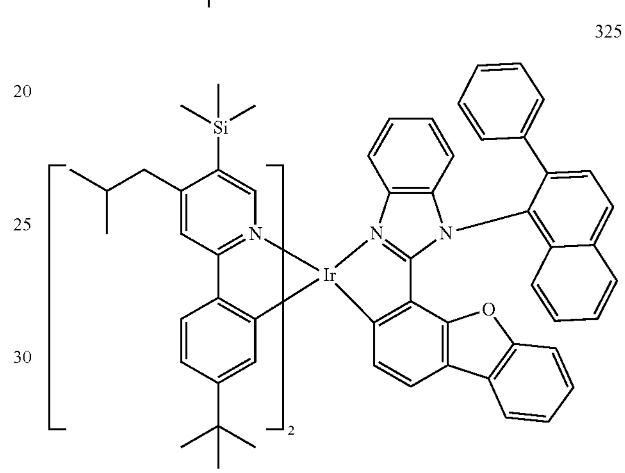
326
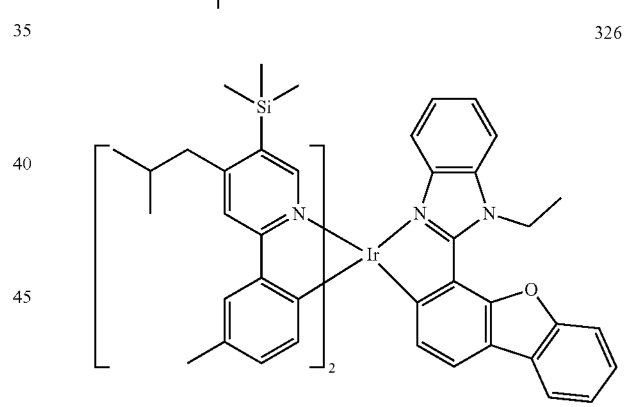
327
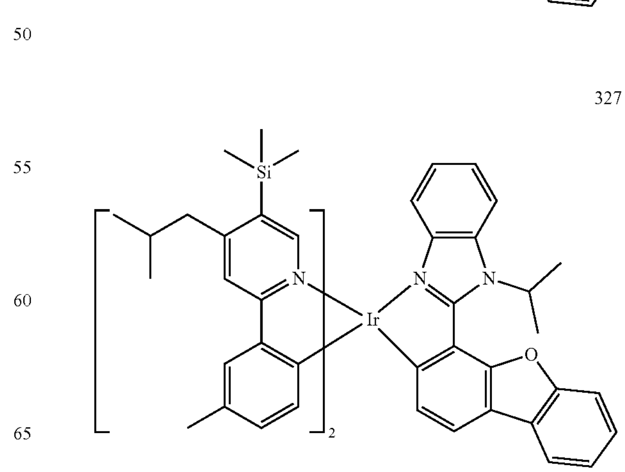

-continued
328
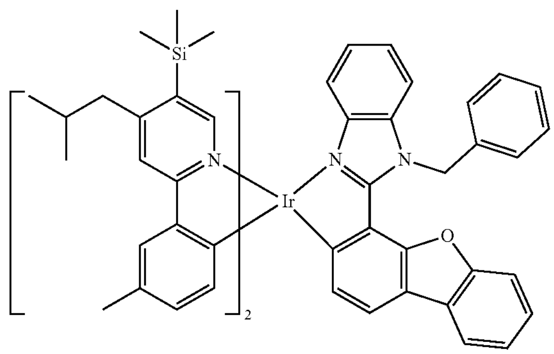
329
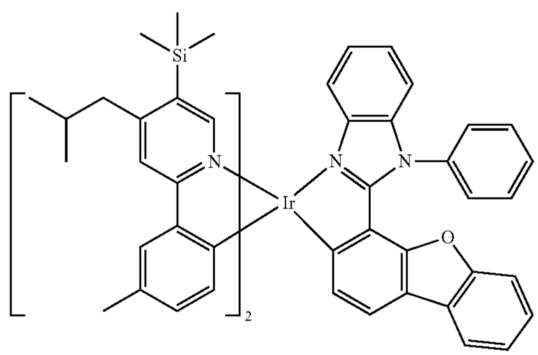
330
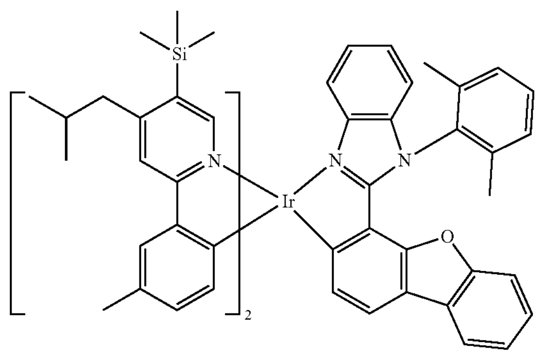
331
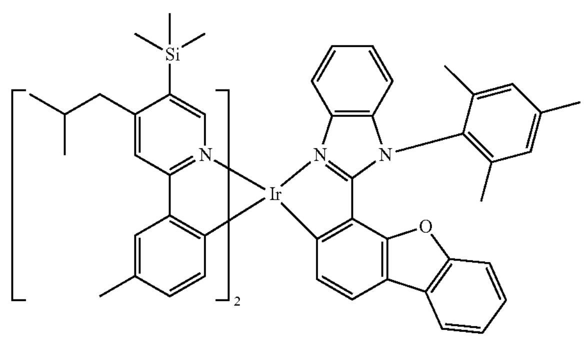
-continued
332
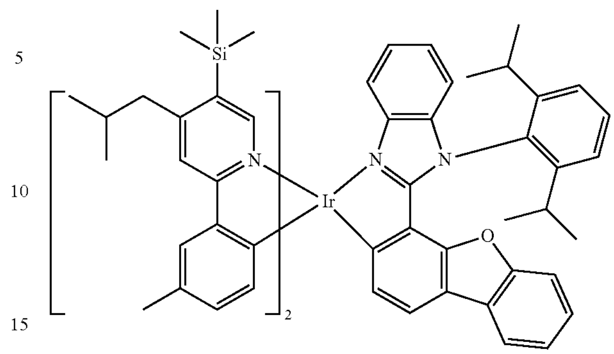
333
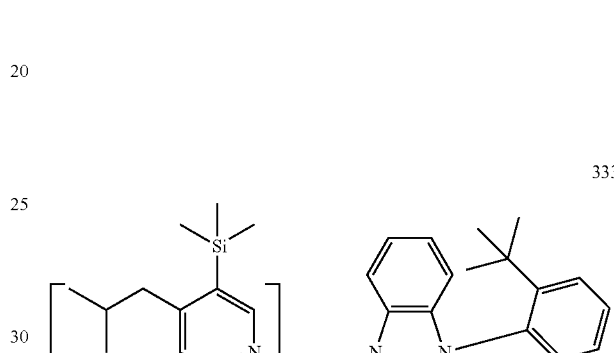
334
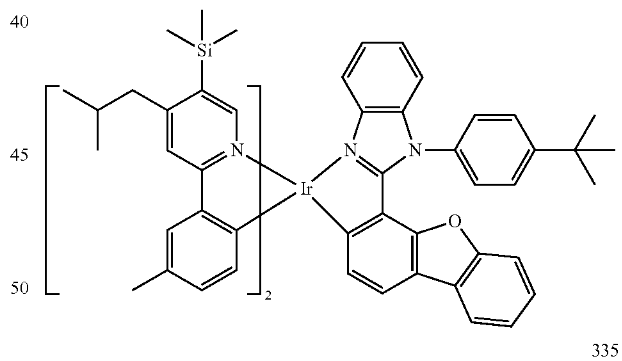
335
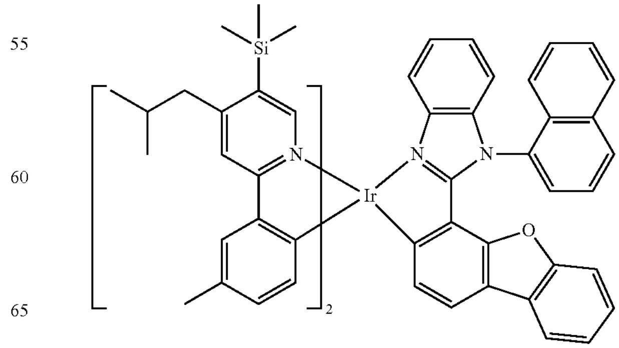

336
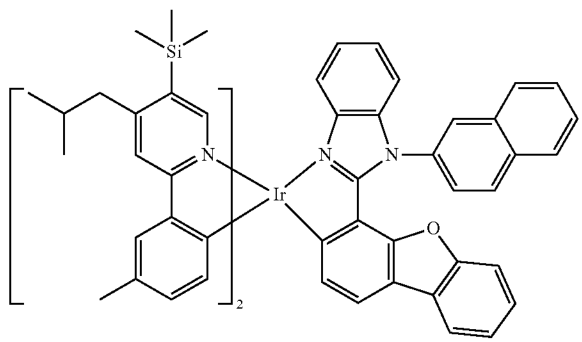
337
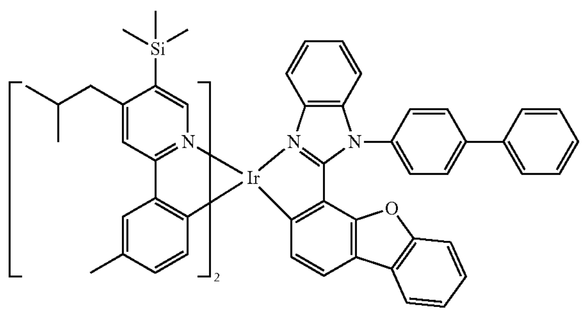
338
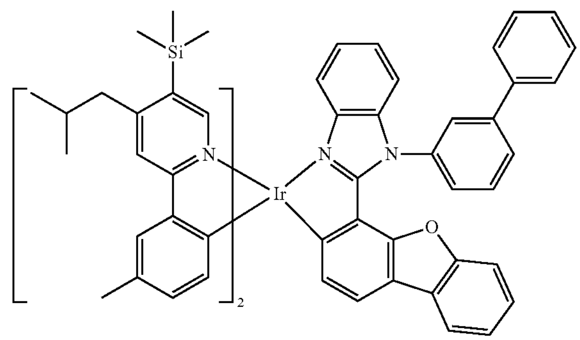
339
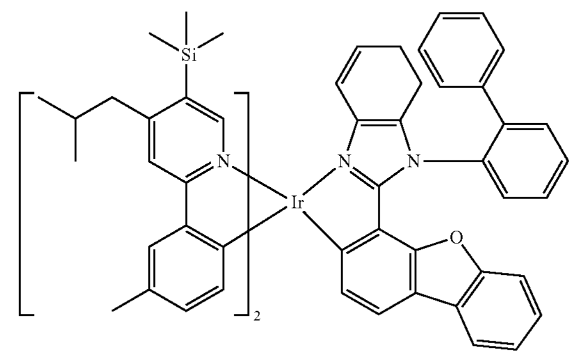
340
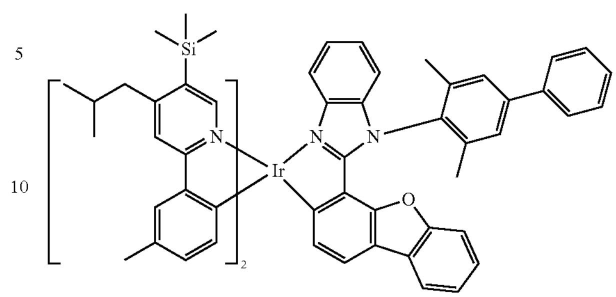
341
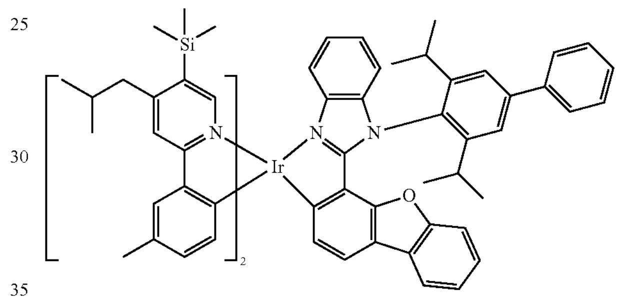
342
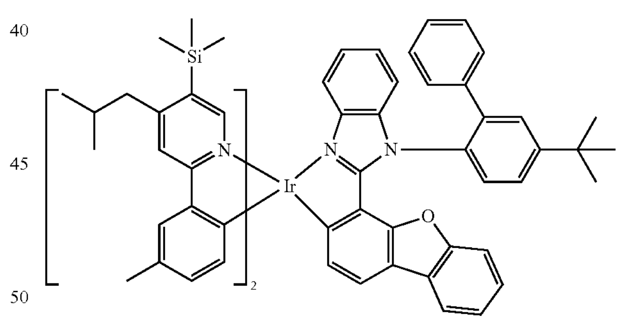
343
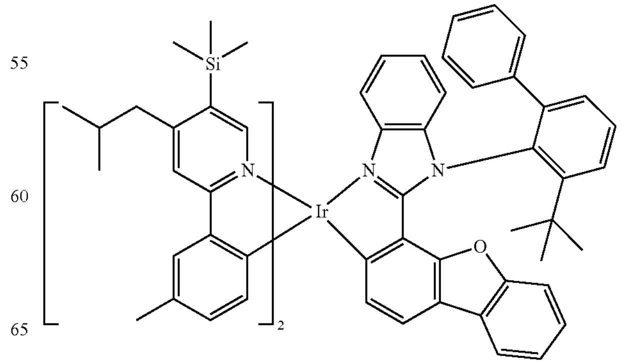

-continued
343
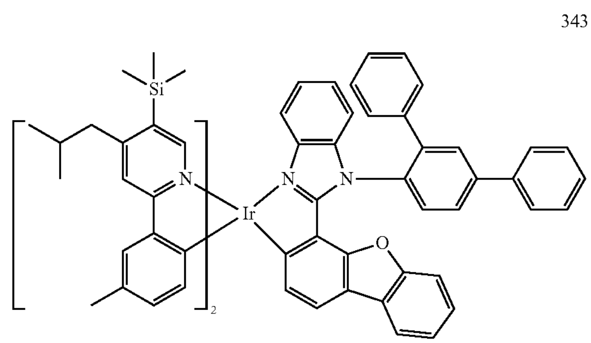
345
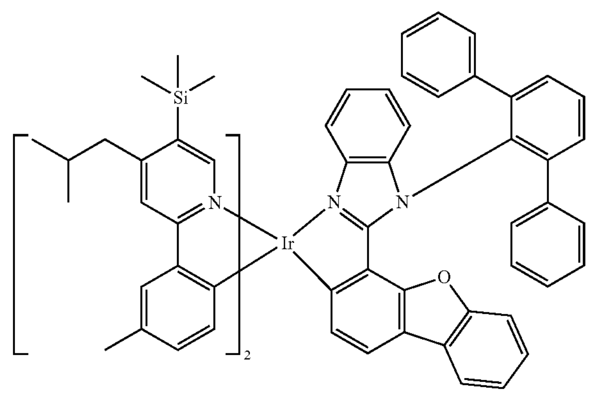
346
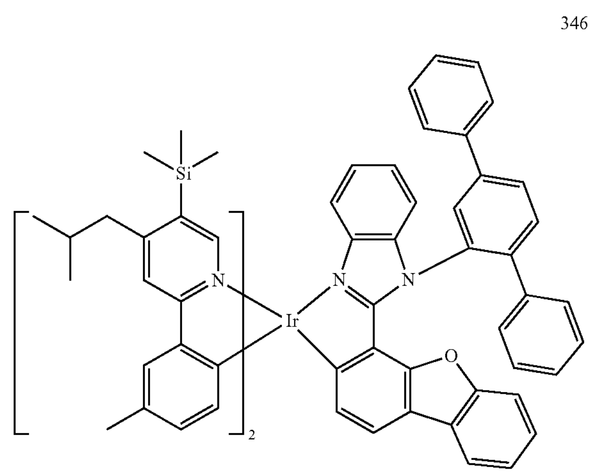
347
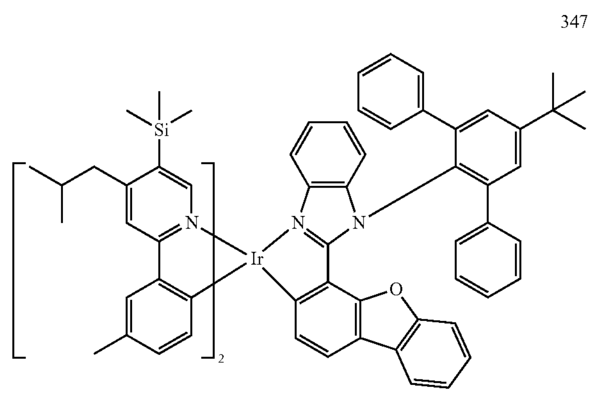
-continued
348
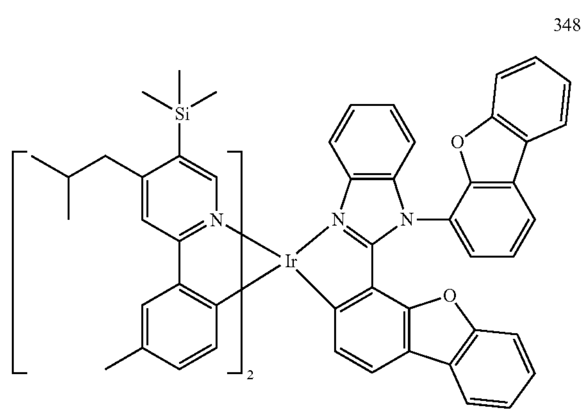
349
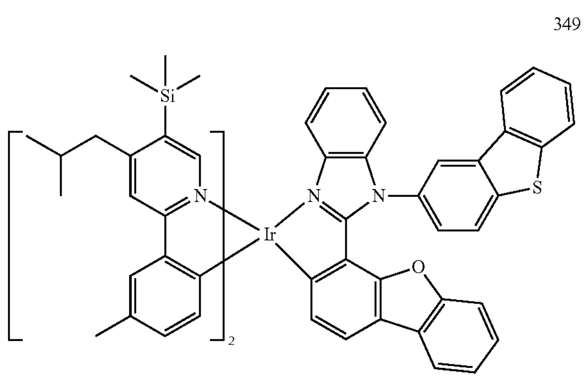
350
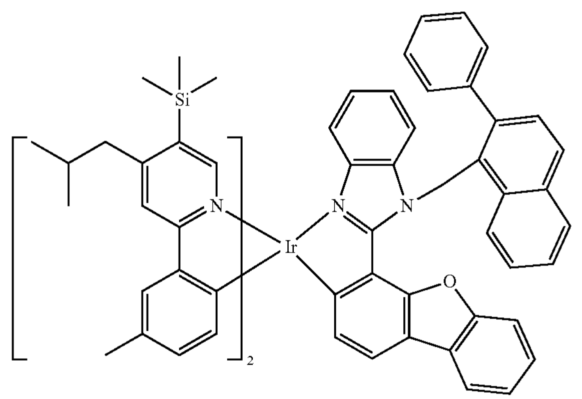
351
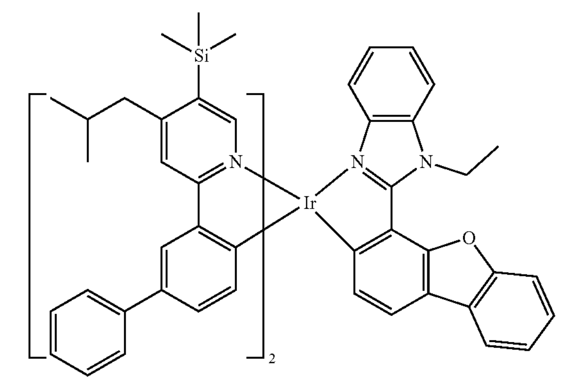

-continued
352
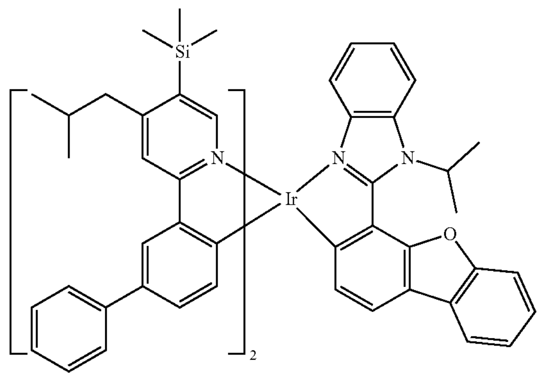
353
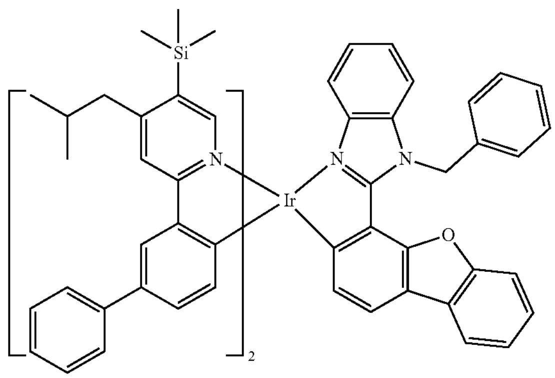
354
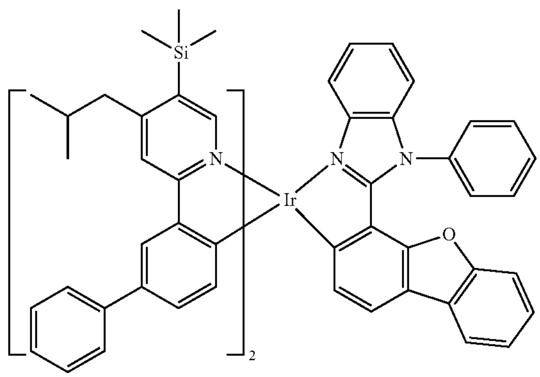
355
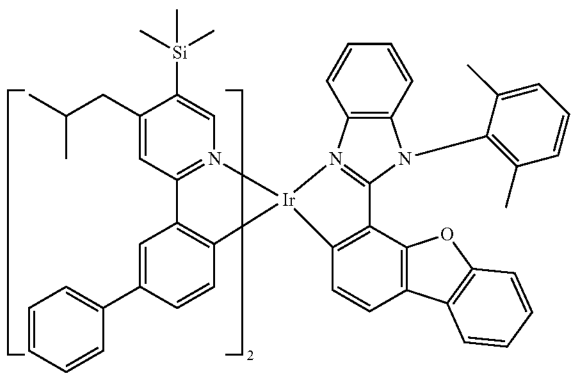
-continued
356
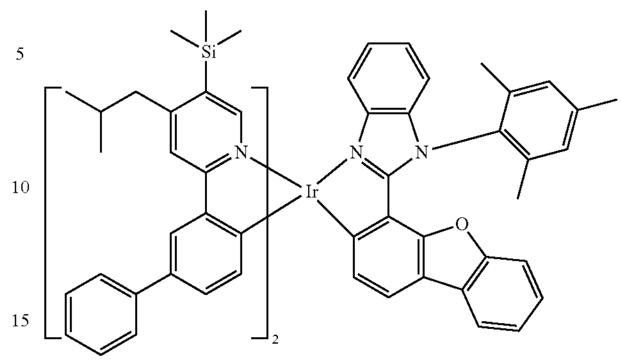
357
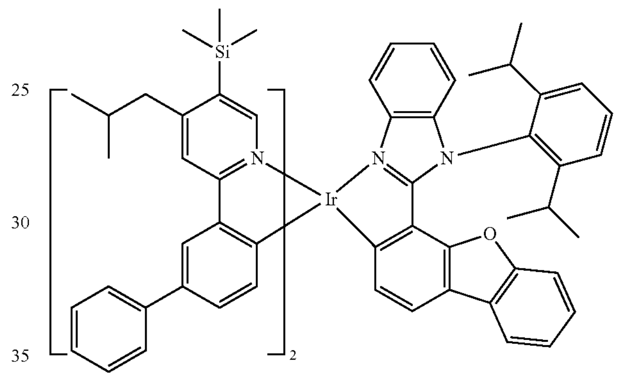
358
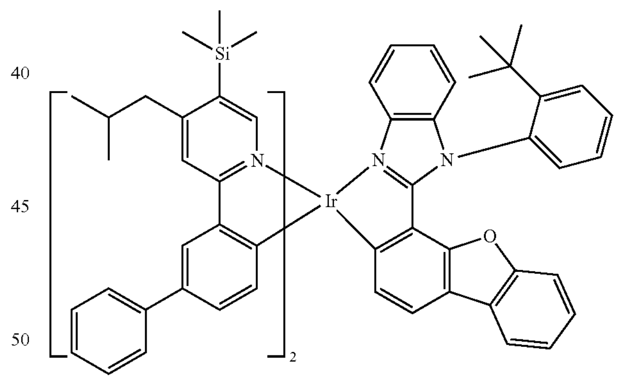
359
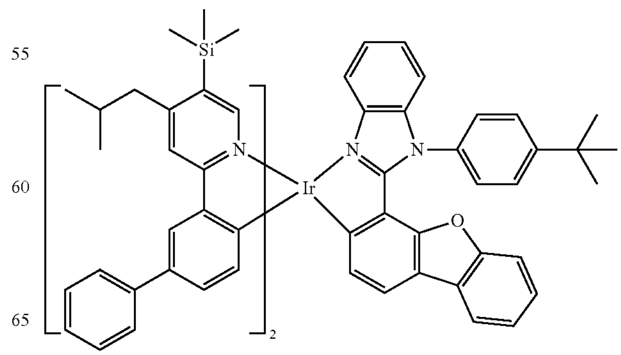

-continued
361
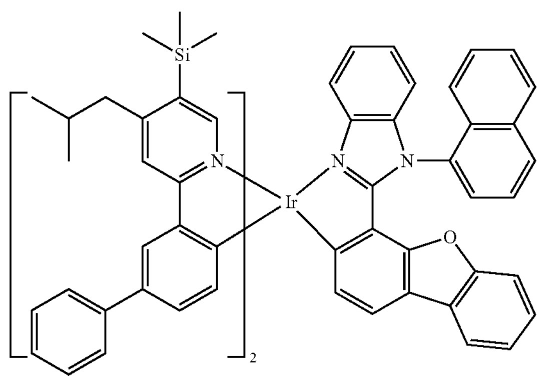
362
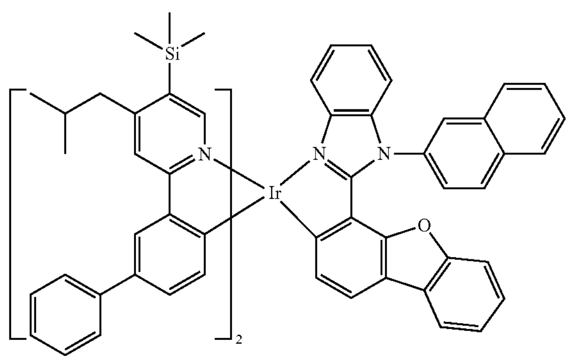
363
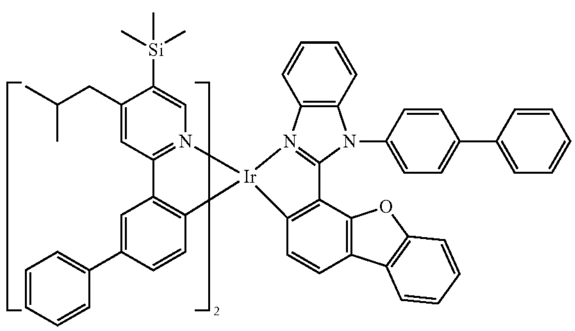
364
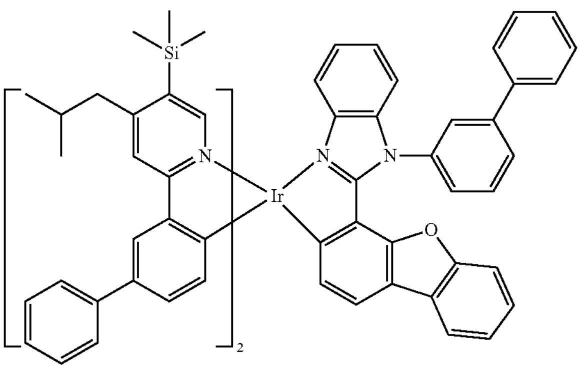
-continued
365
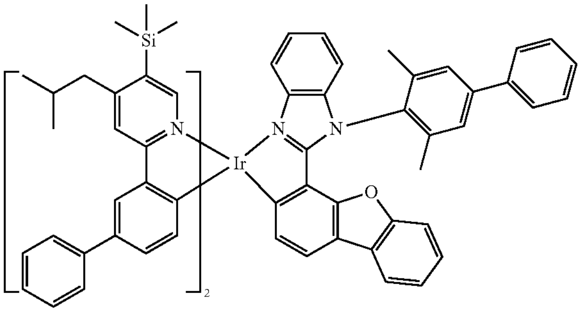
366
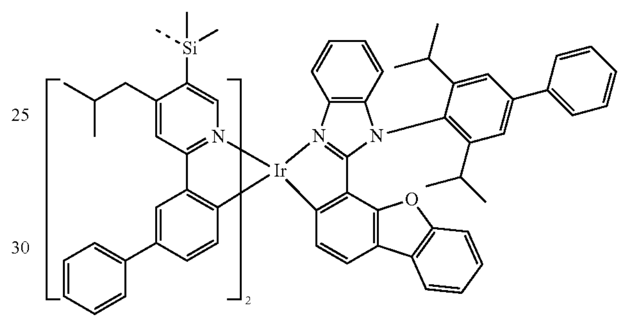
367
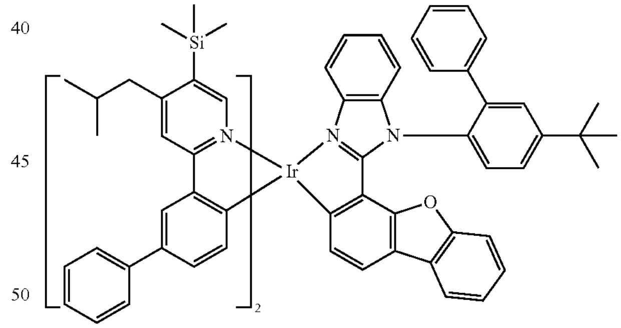
368
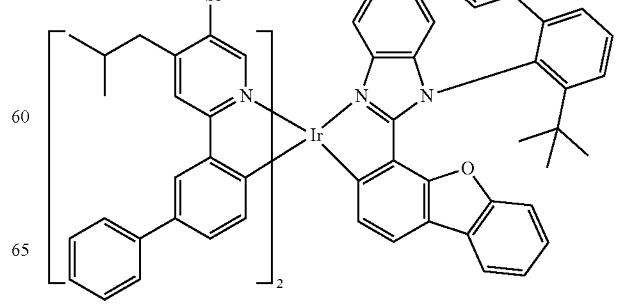

-continued
369
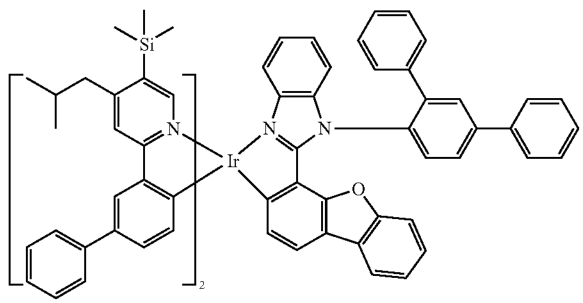
370
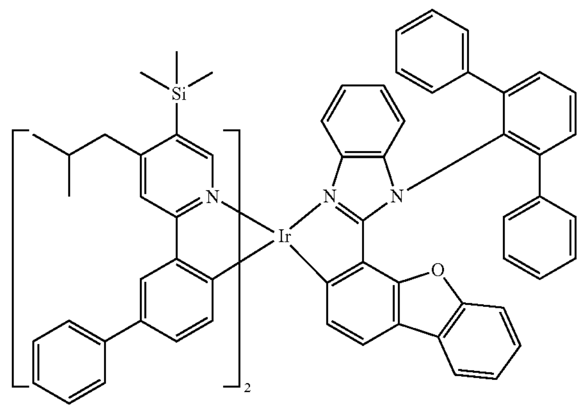
371
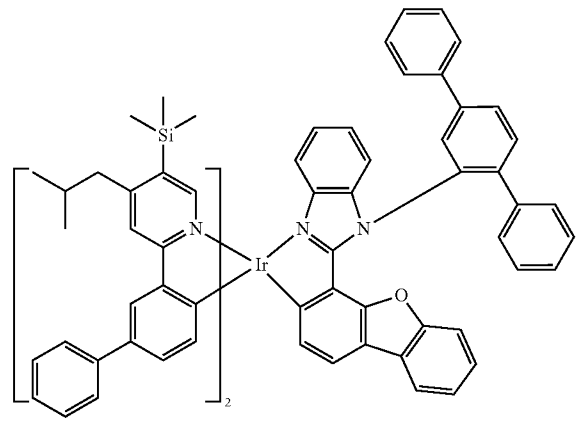
372
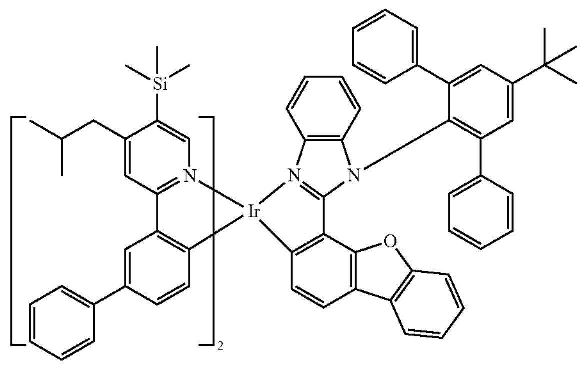
-continued
373
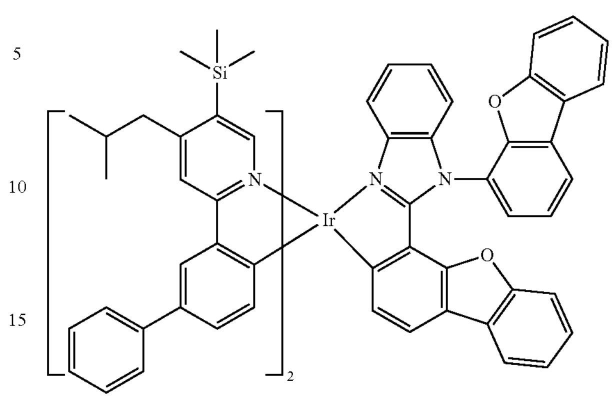
374
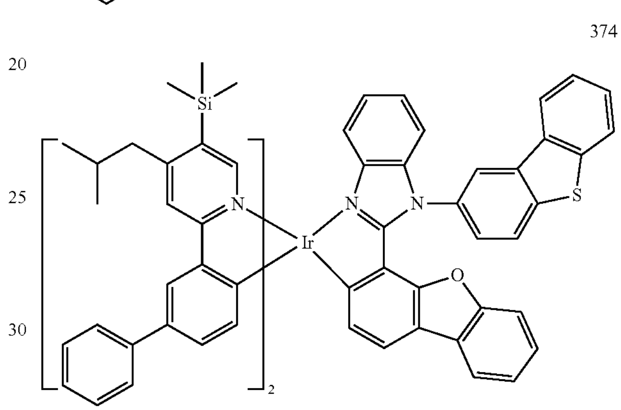
375
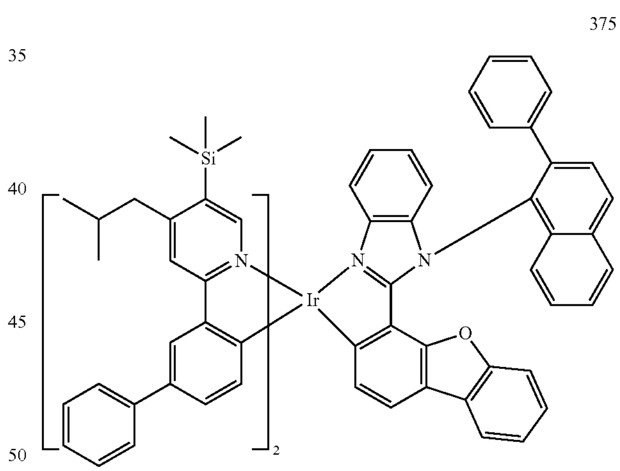
376
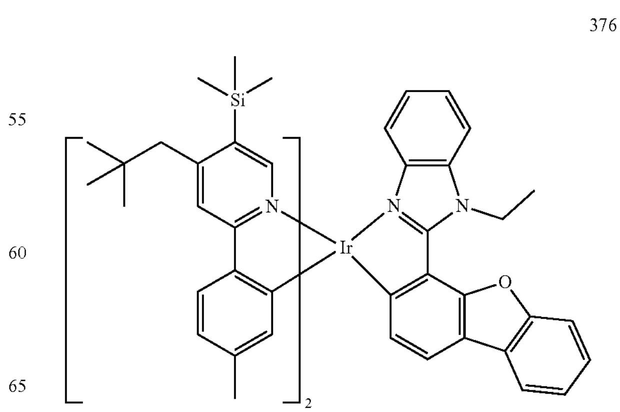

-continued
377
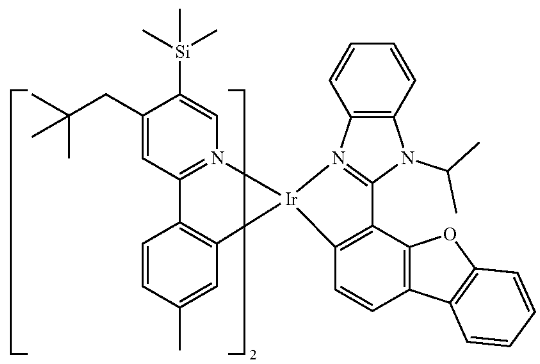
378
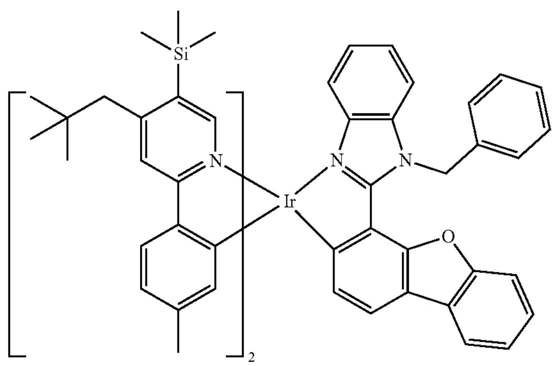
379
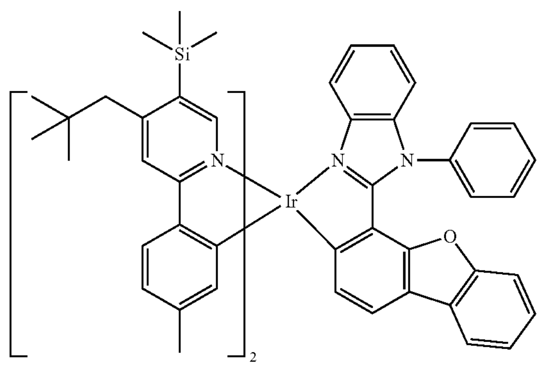
380
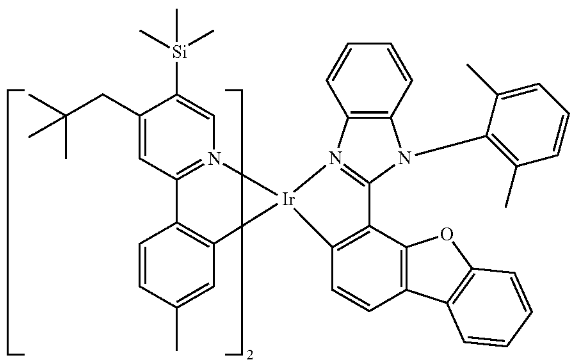
-continued
381
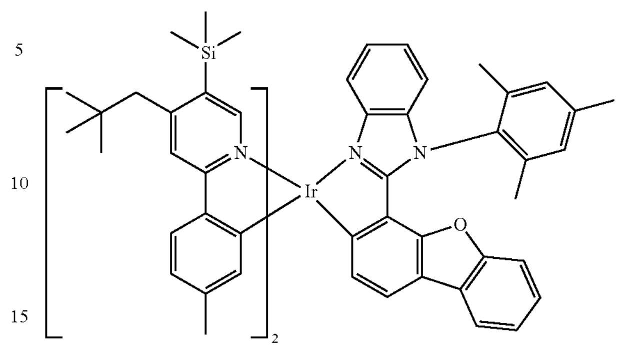
382
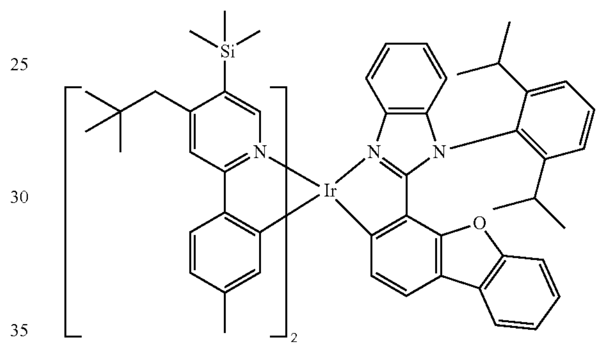
383
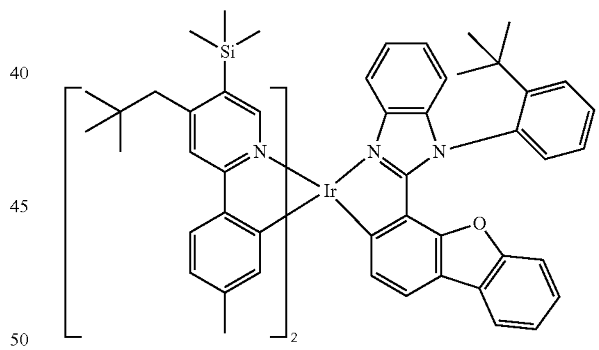
384
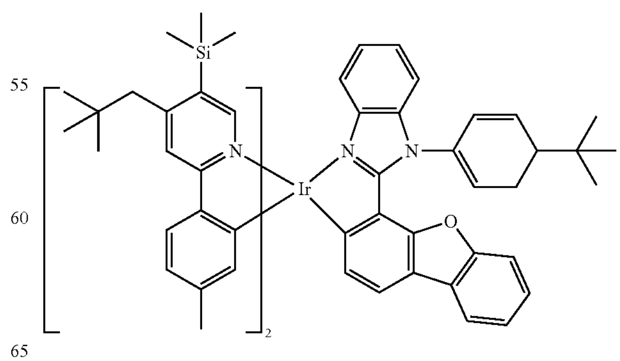

-continued
385
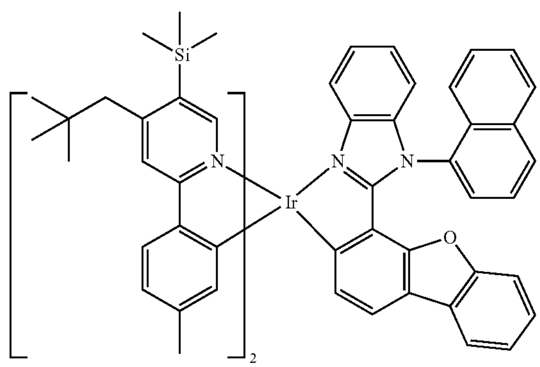
386
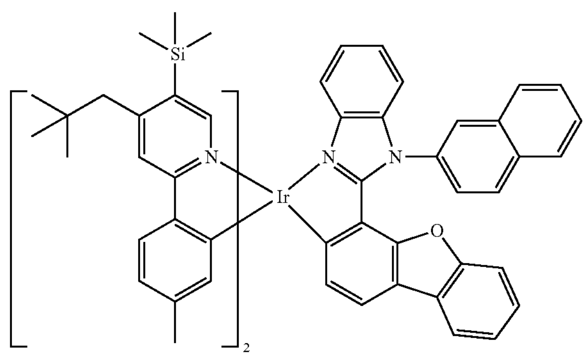
387
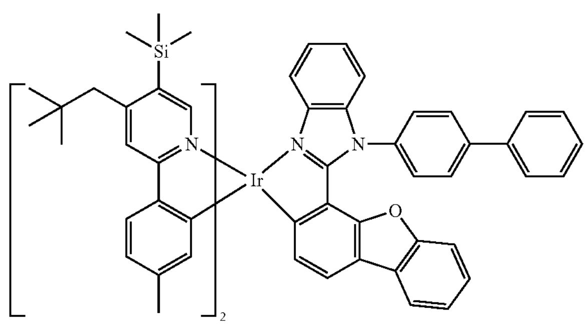
388
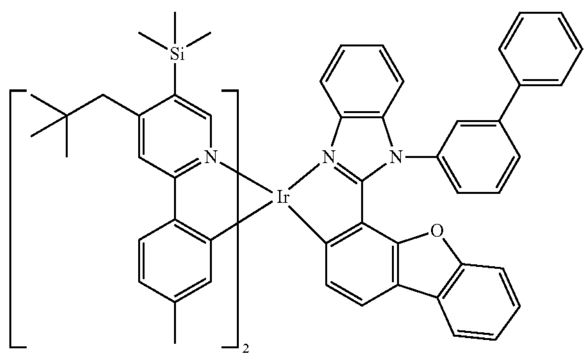
-continued
389
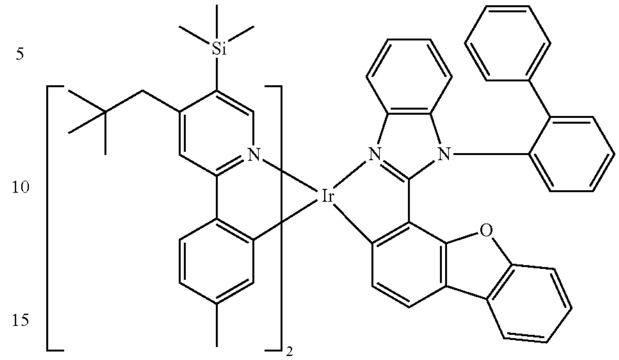
390
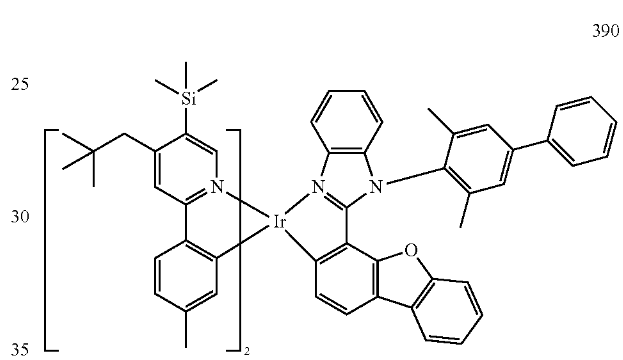
391
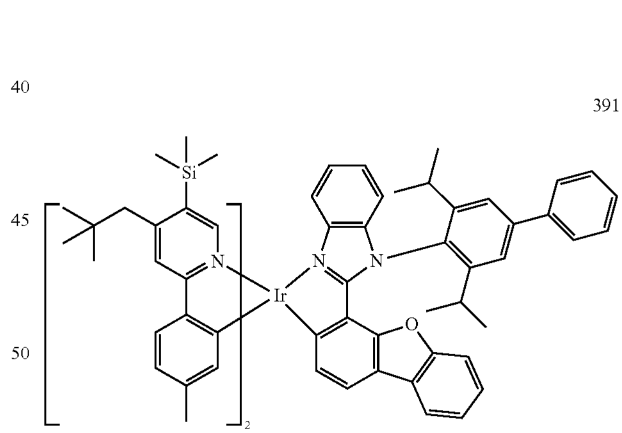
392
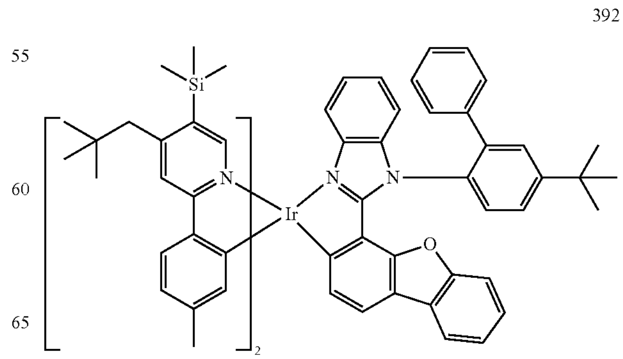

-continued
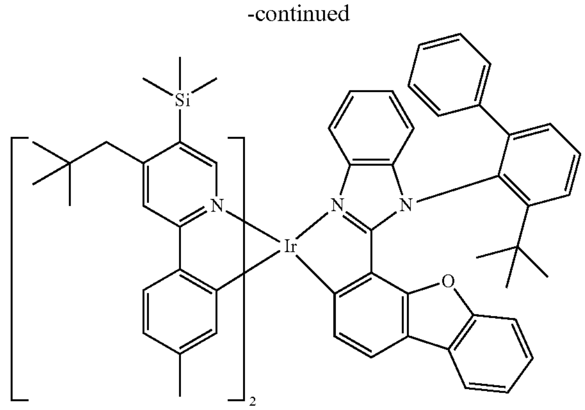
393
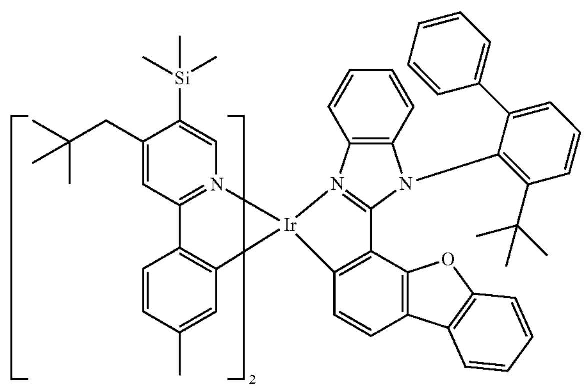
394
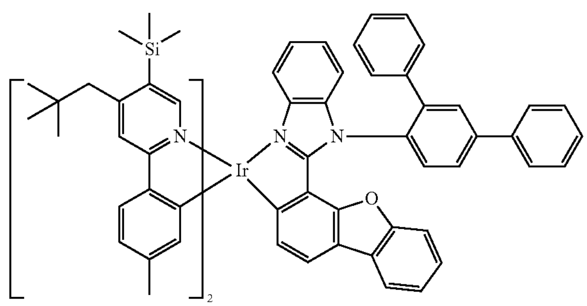
395
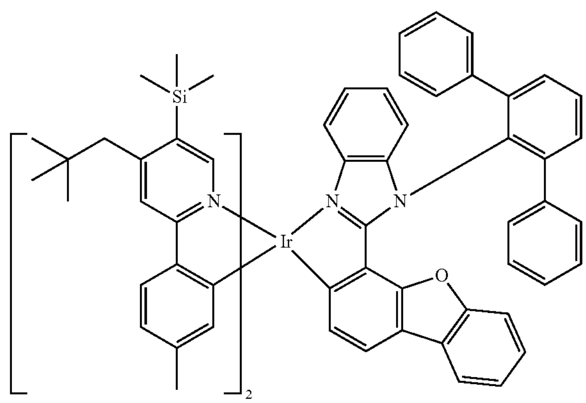
-continued
396
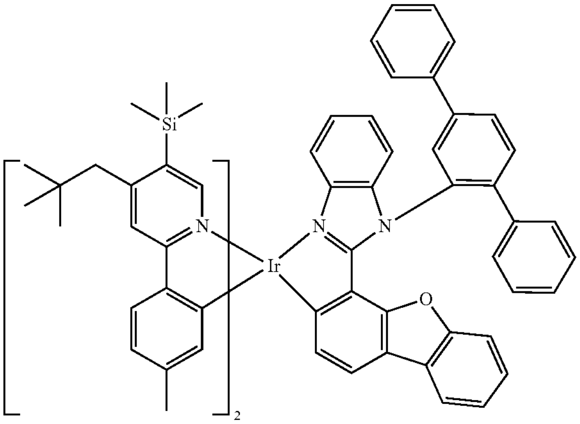
397
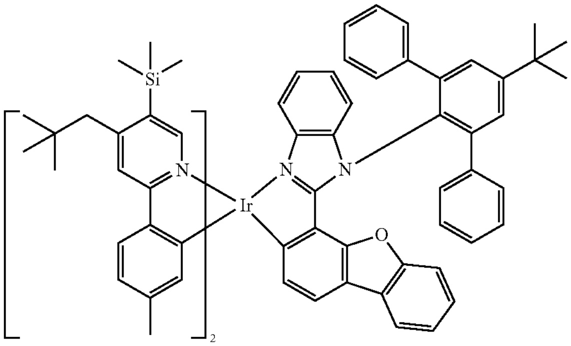
398
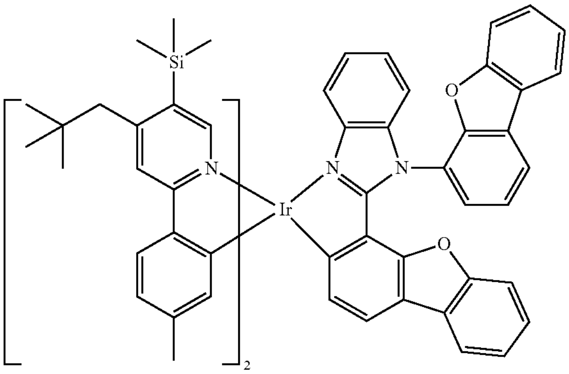
399
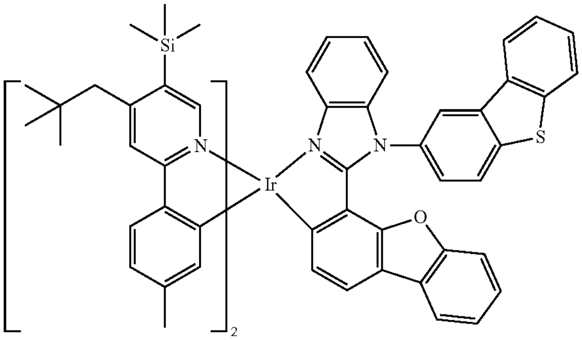

-continued
400
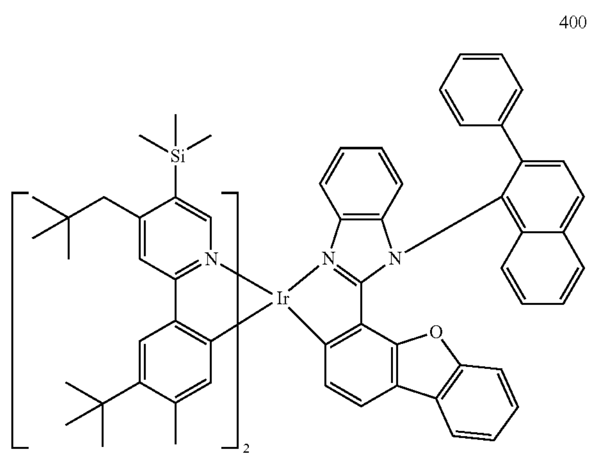
401
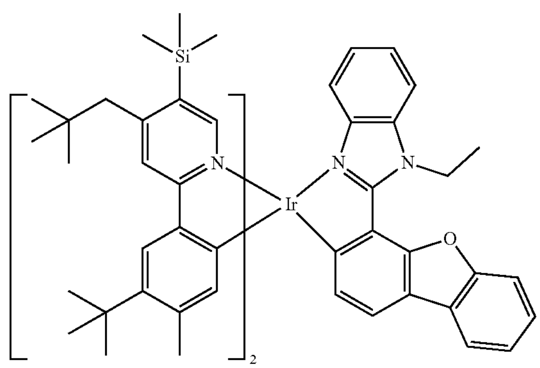
402
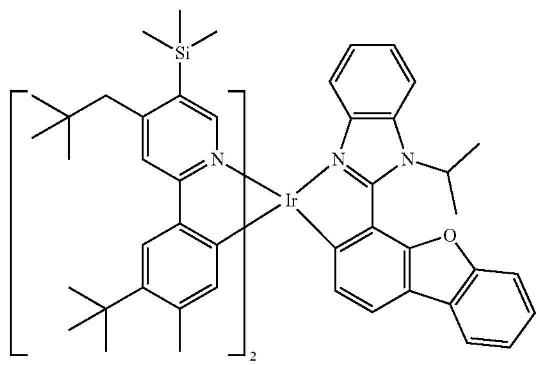
403
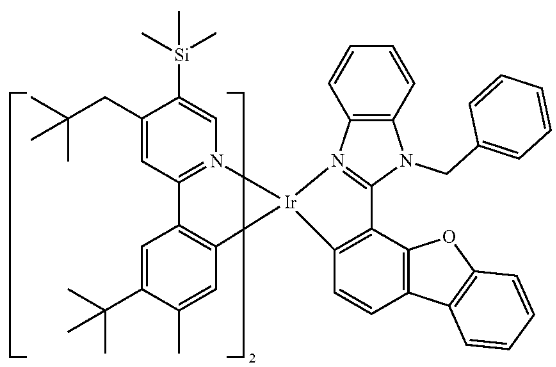
-continued
404
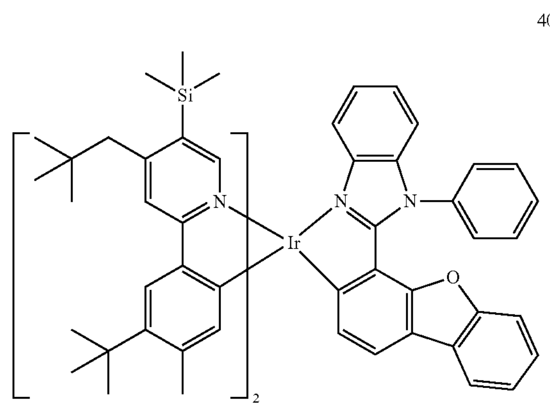
405
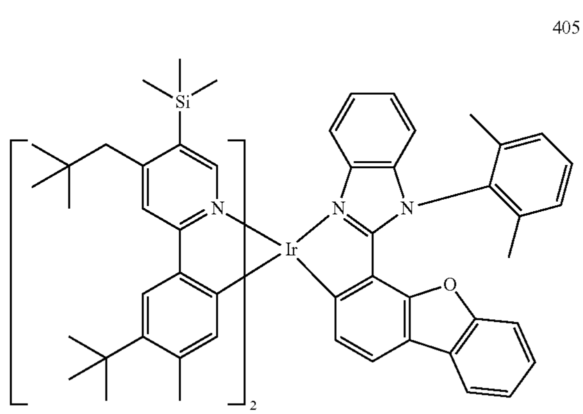
406
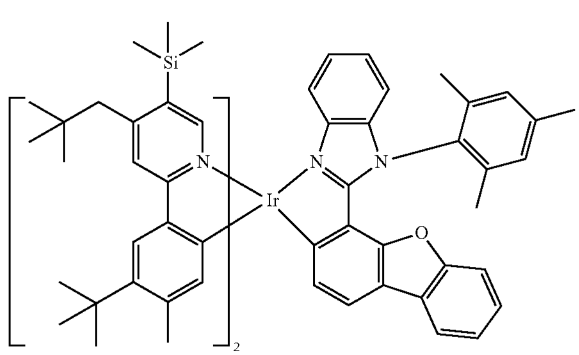
407
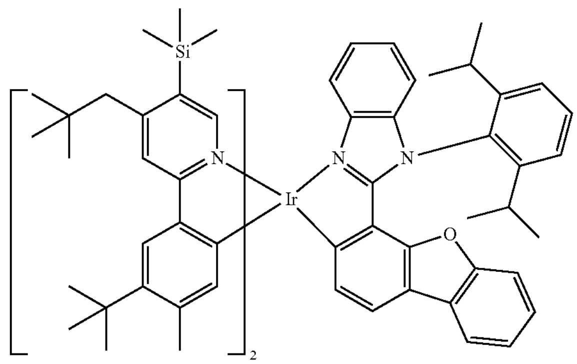

-continued
408
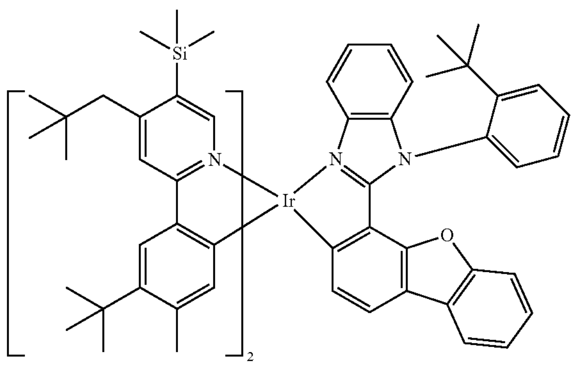
409
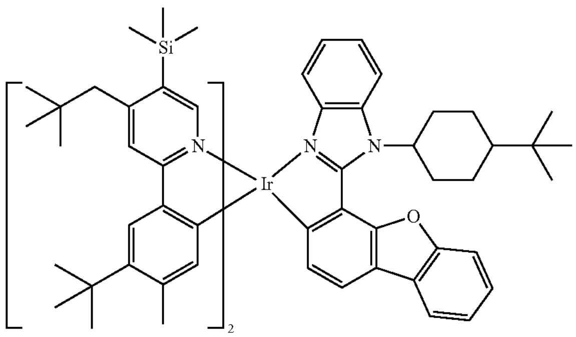
410
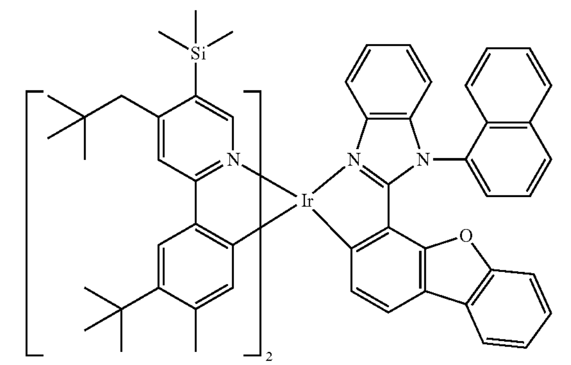
411
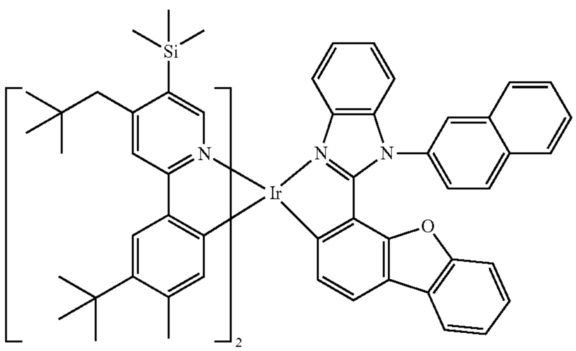
-continued
412
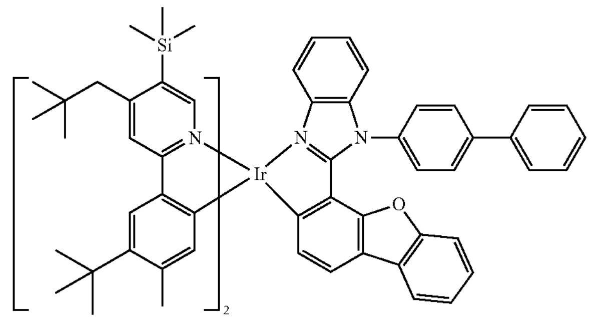
413
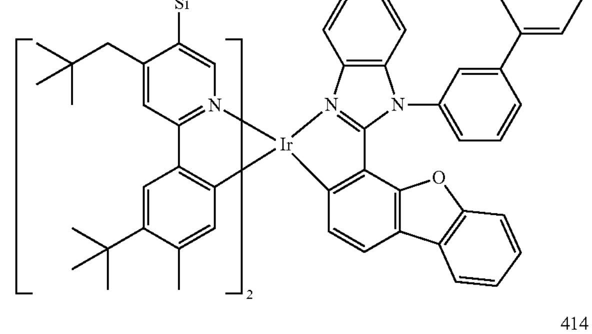
414
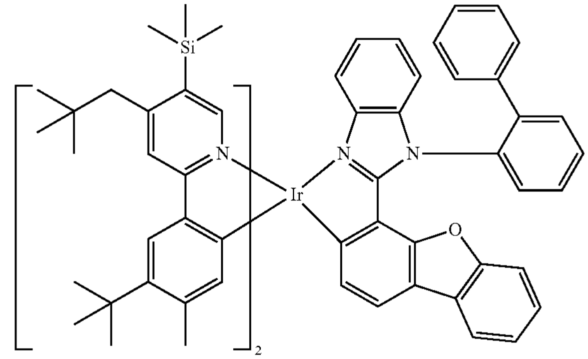
415
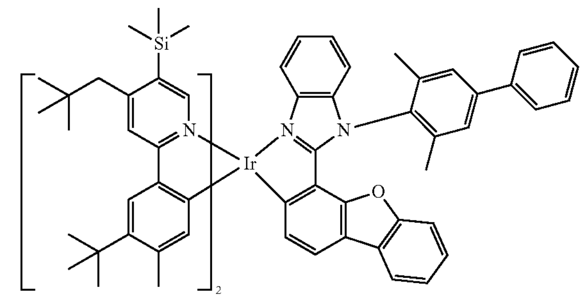

-continued
416
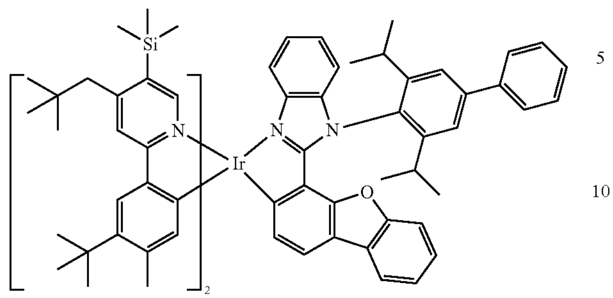
417
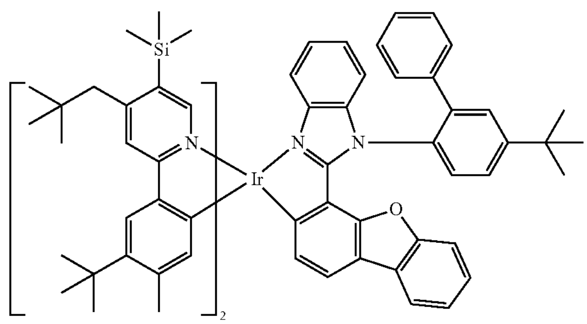
418
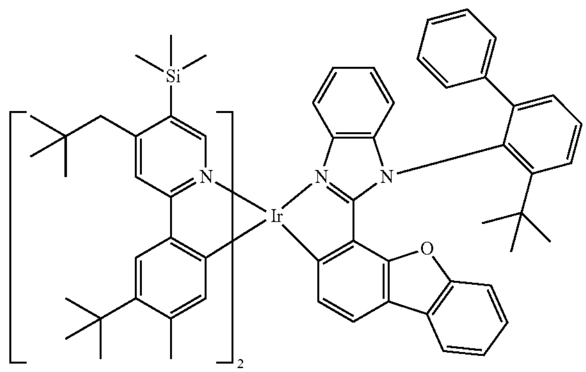
419
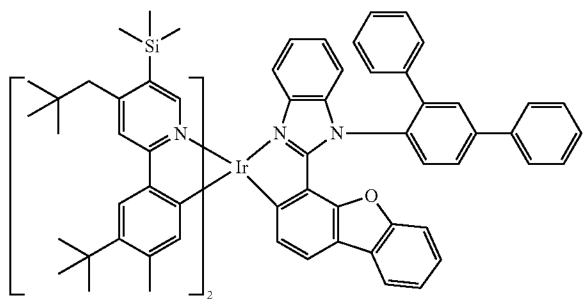
-continued
420
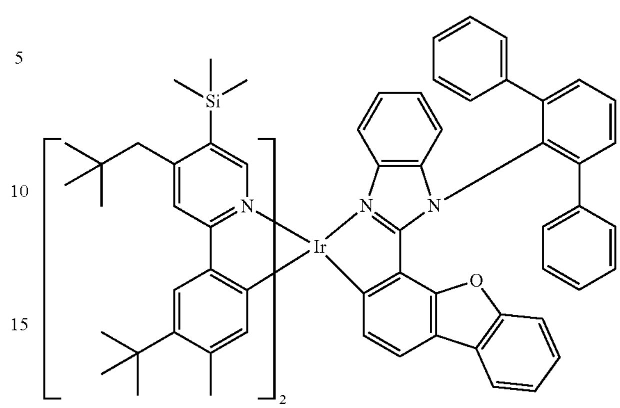
421
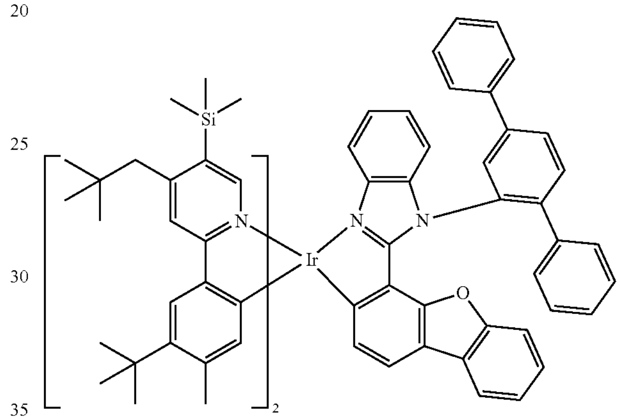
422
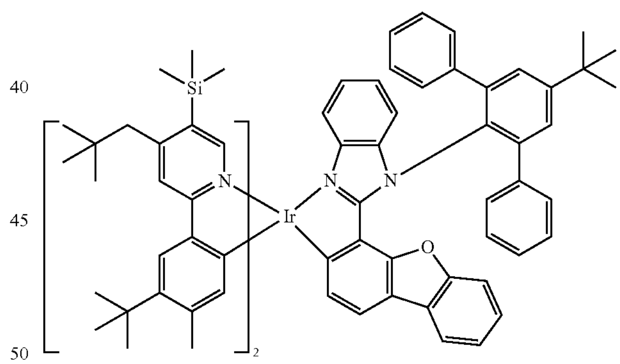
423
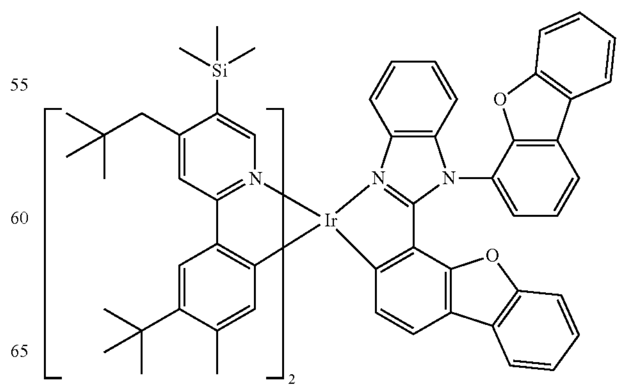

424
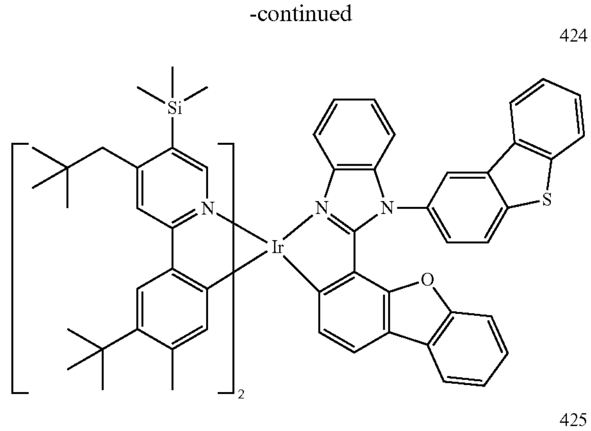
425
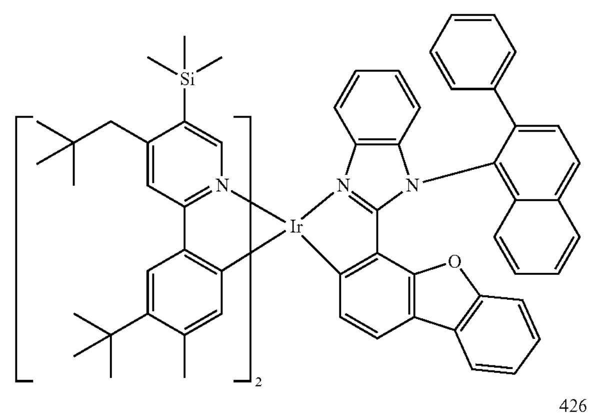
426
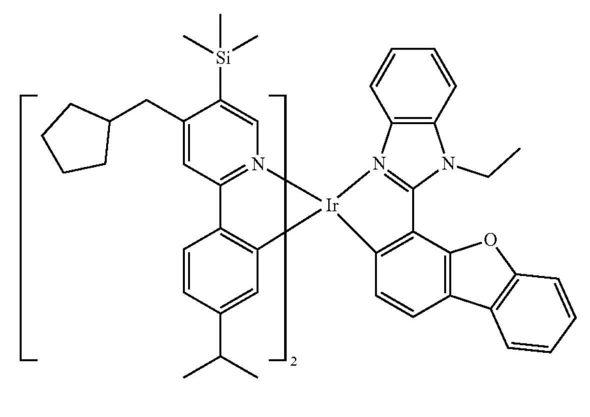
427
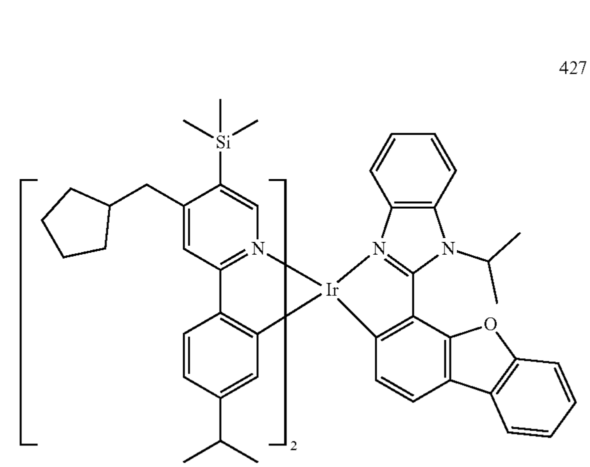
428
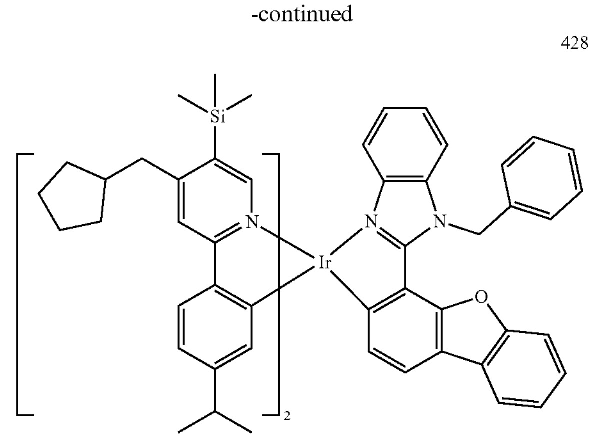
429
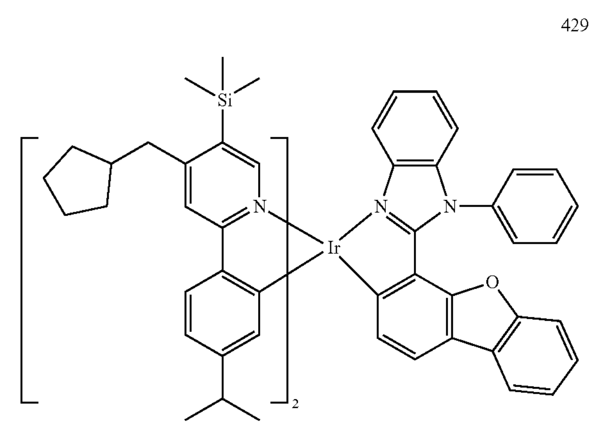
430
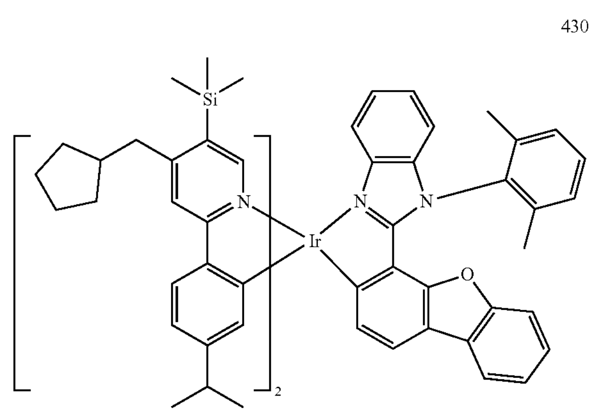
431
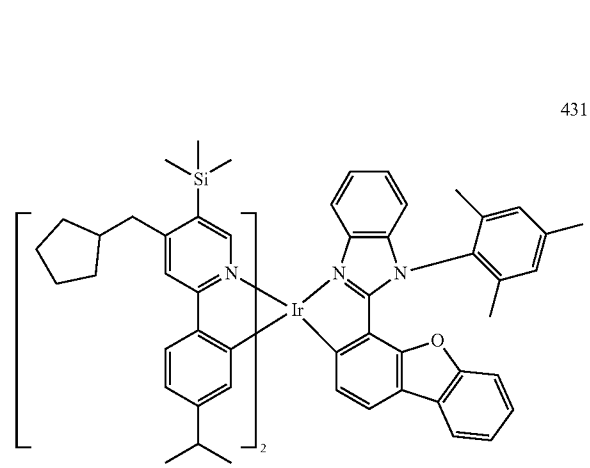

432
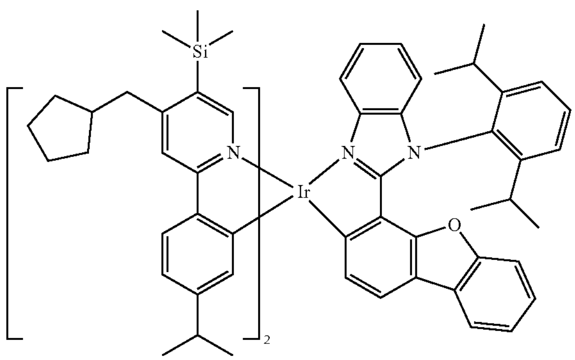
433
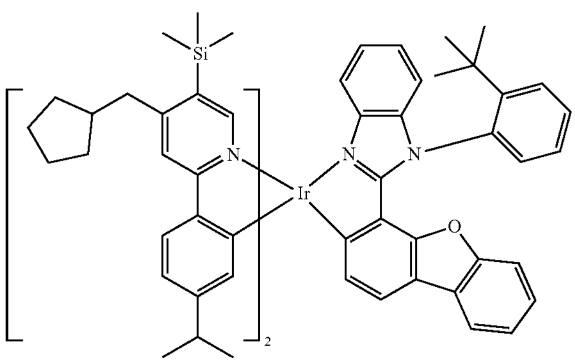
434
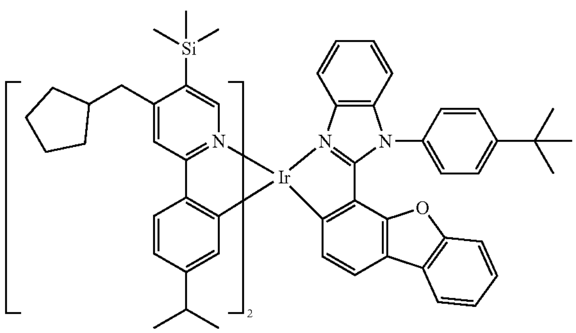
435
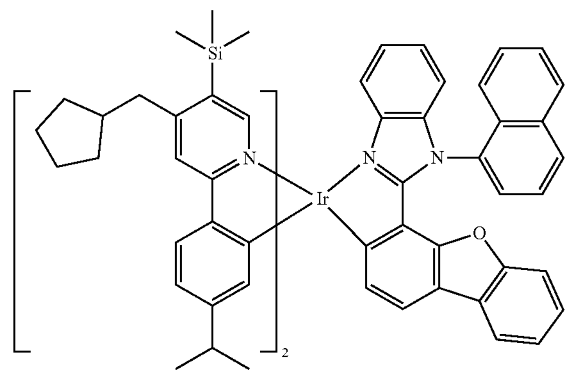
436
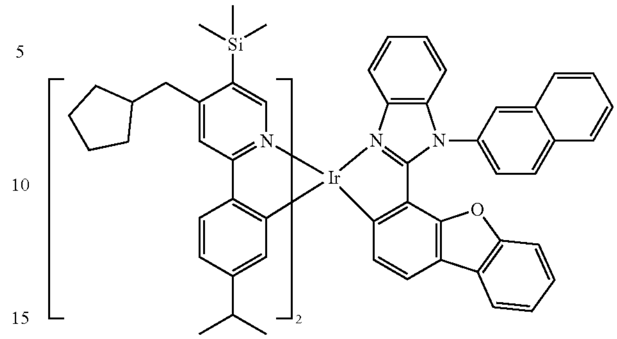
437
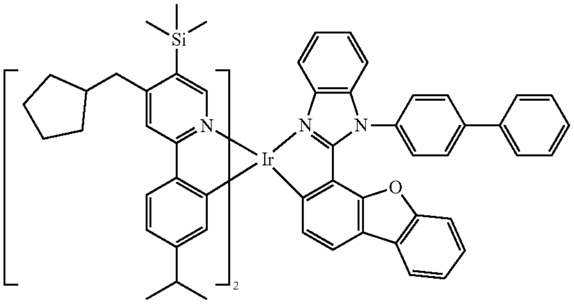
438
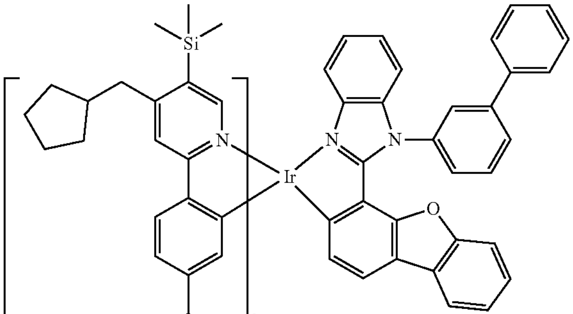
439
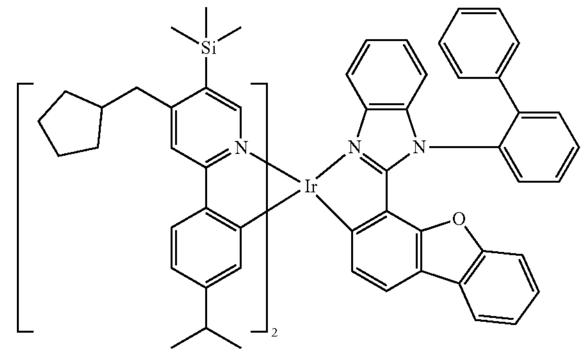

-continued
440
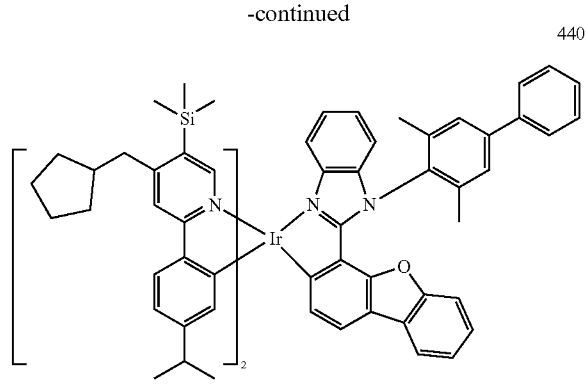
441
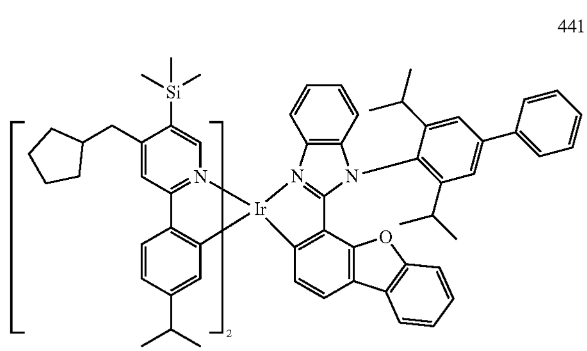
442
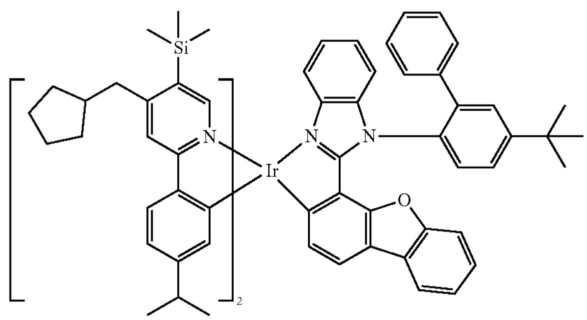
443
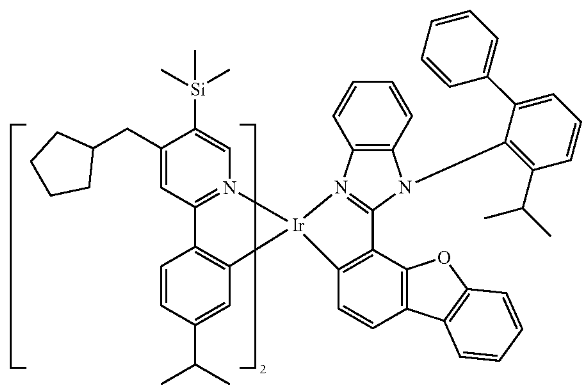
-continued
444
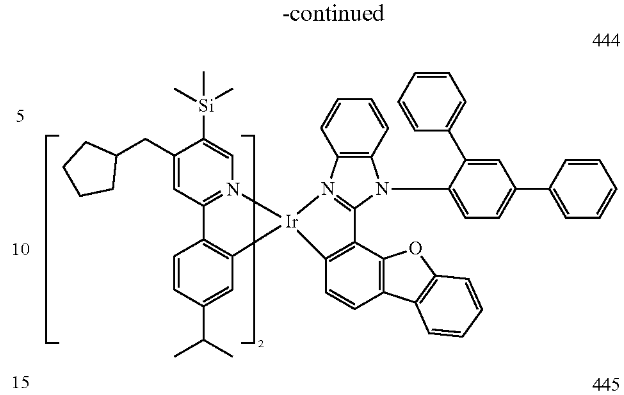
445
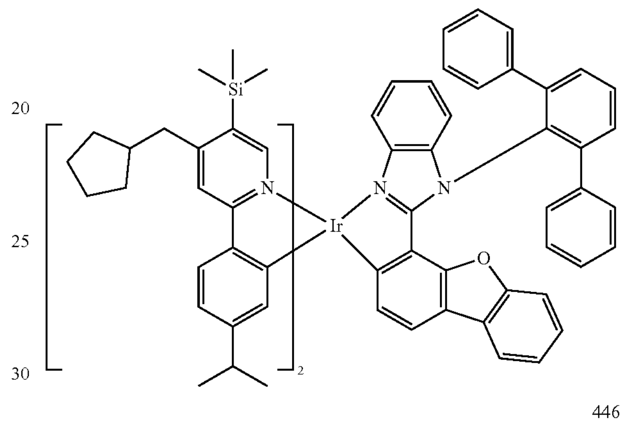
446
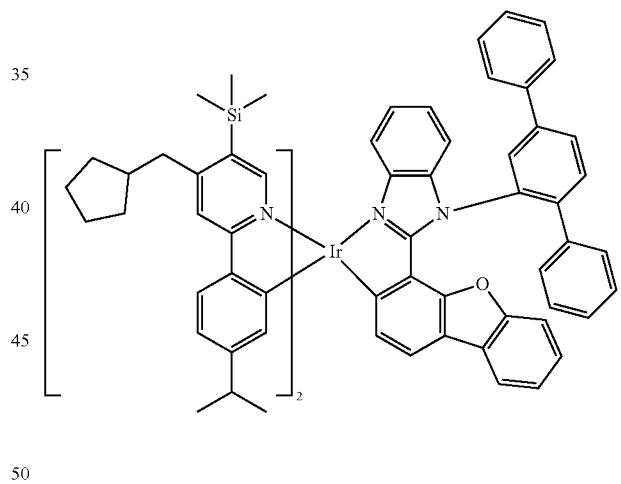
447
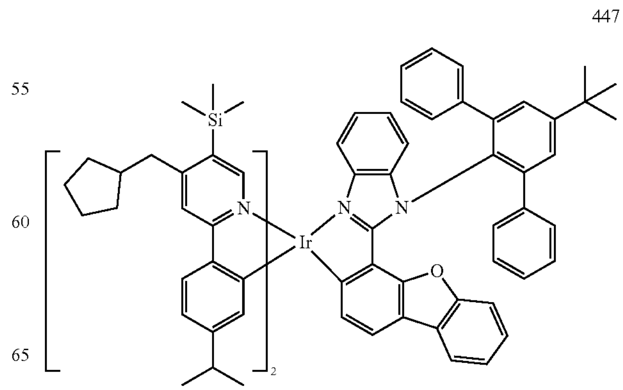

-continued
448
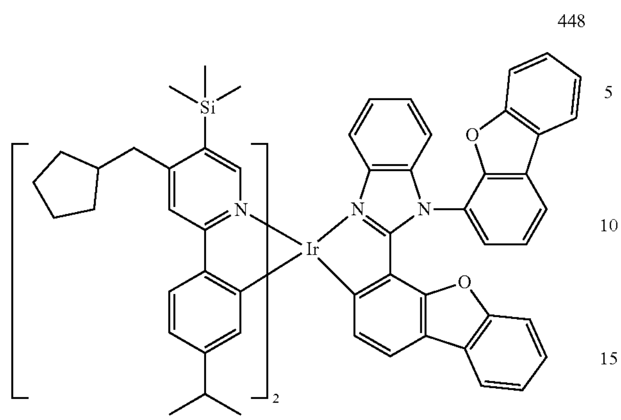
449
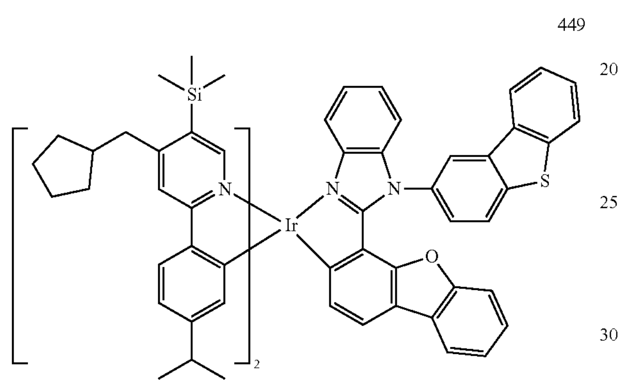
450
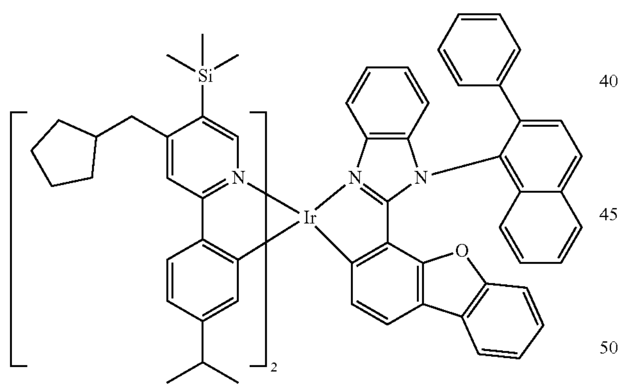
451
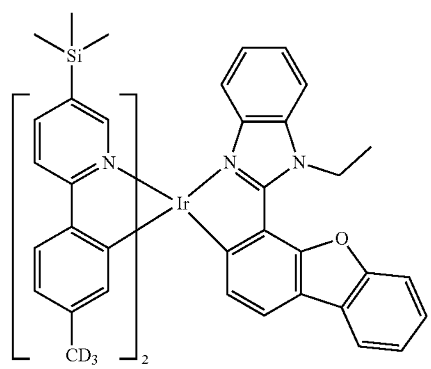
-continued
452
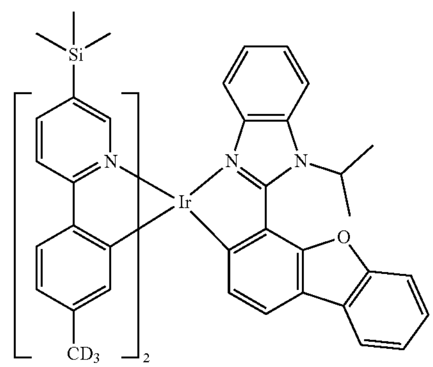
453
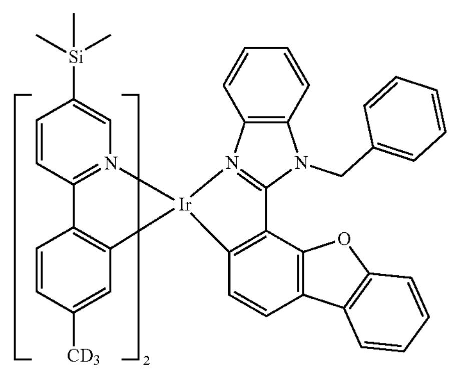
454
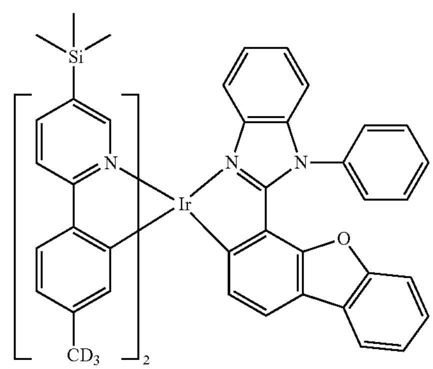
455
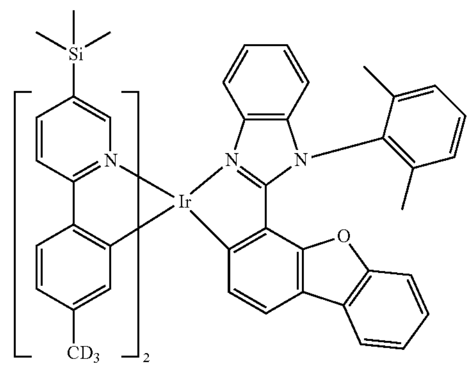

456
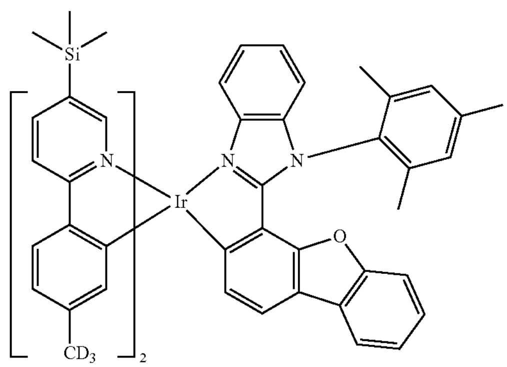
457
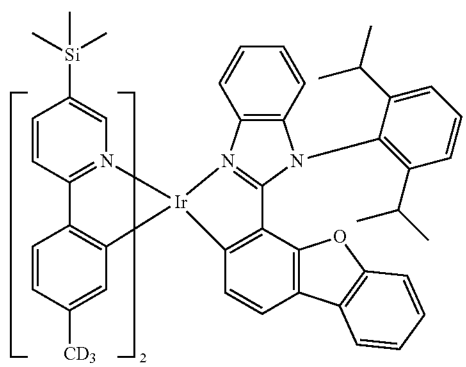
458
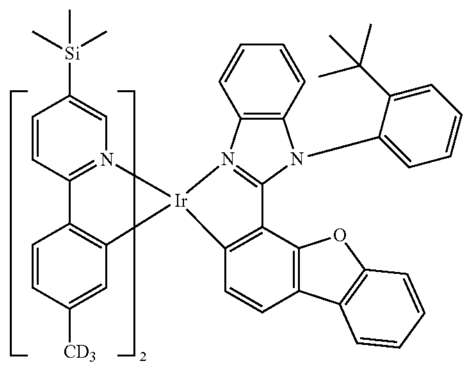
459
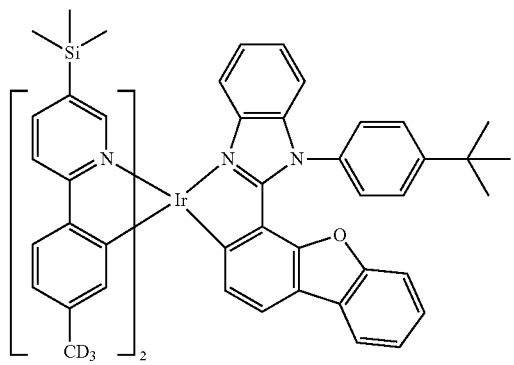
460
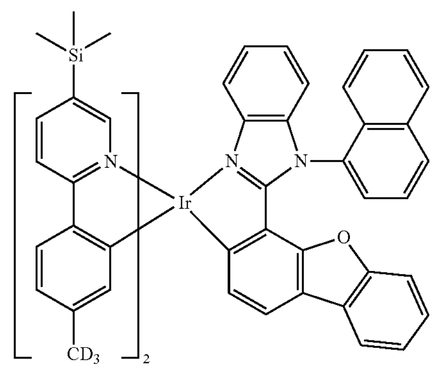
461
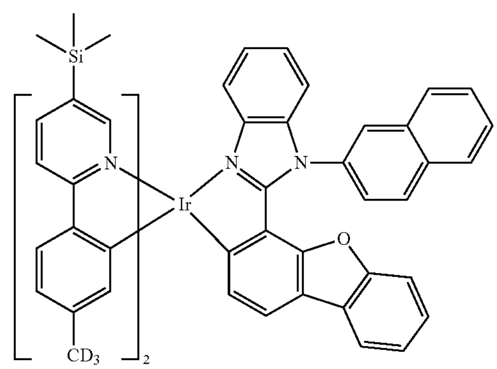
462
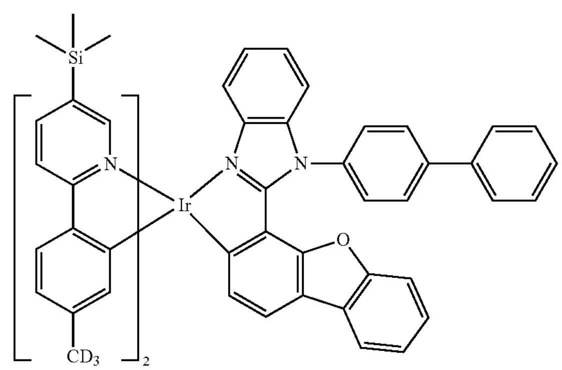
463
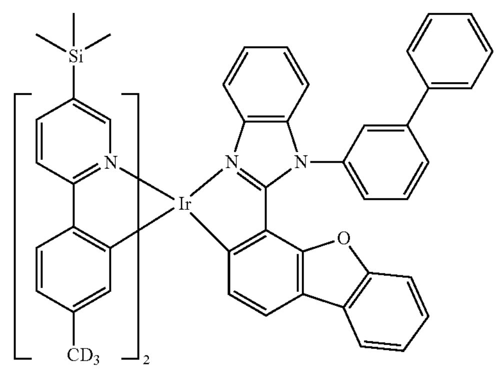

-continued
464
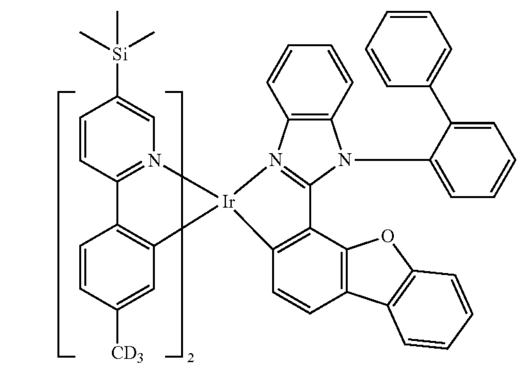
465
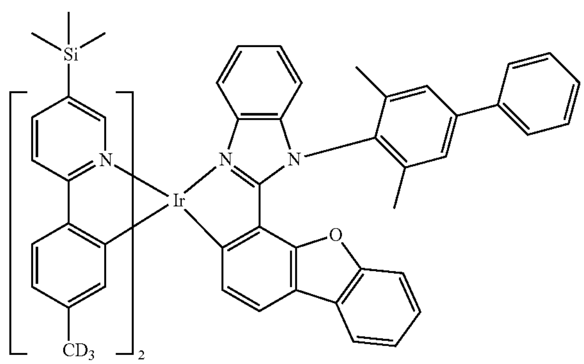
466
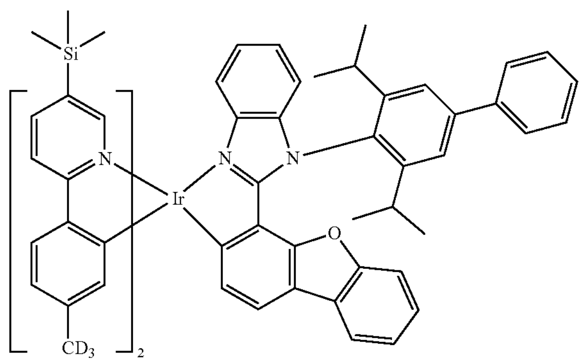
467
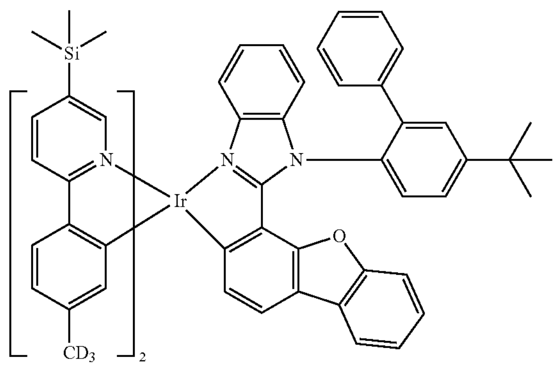
-continued
468
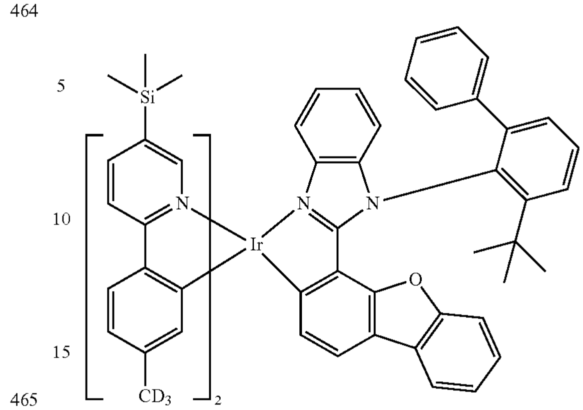
469
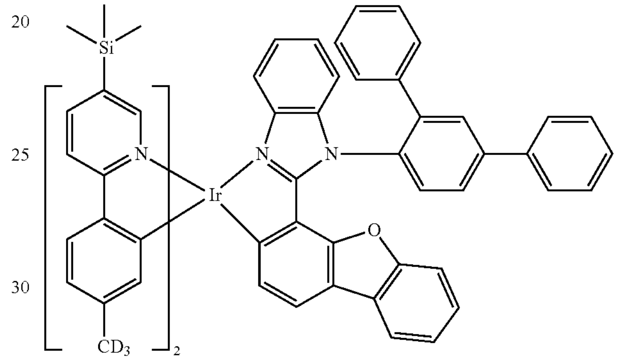
470
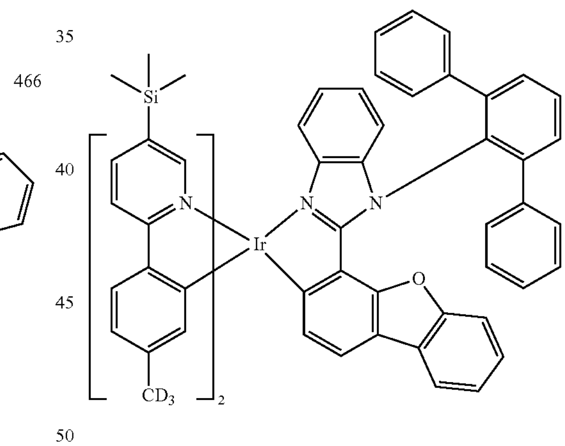
471
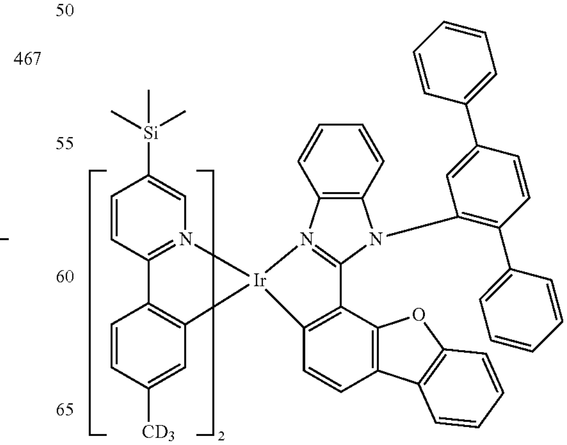

-continued
472
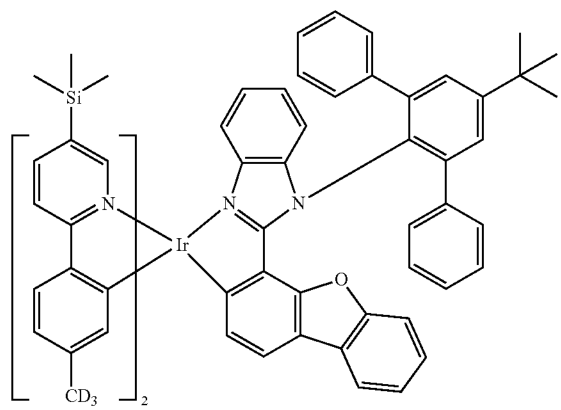
473
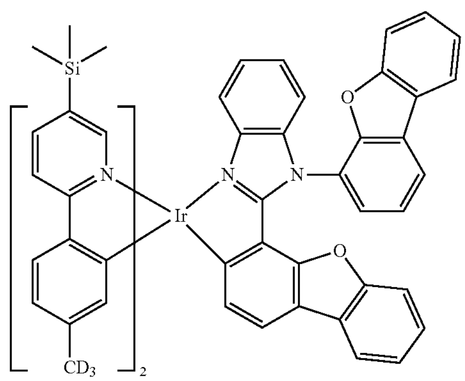
474
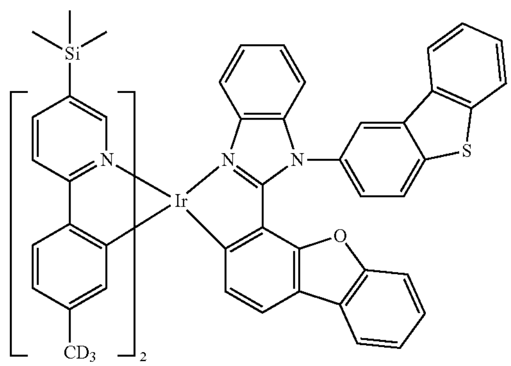
475
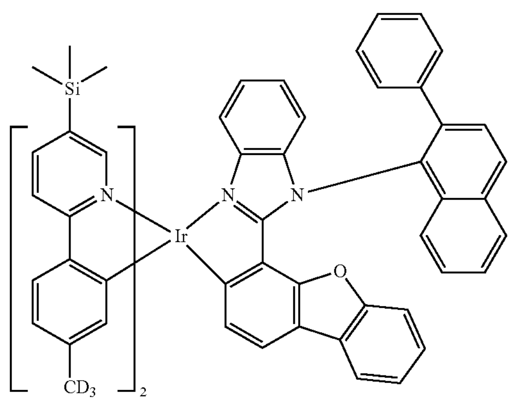
-continued
476
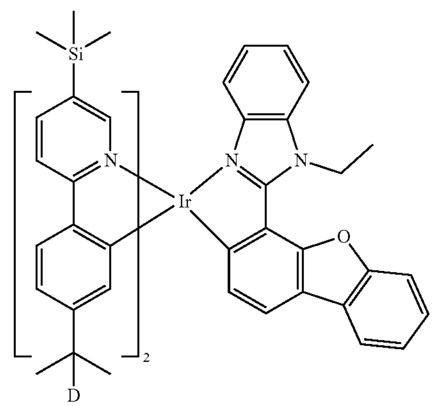
477
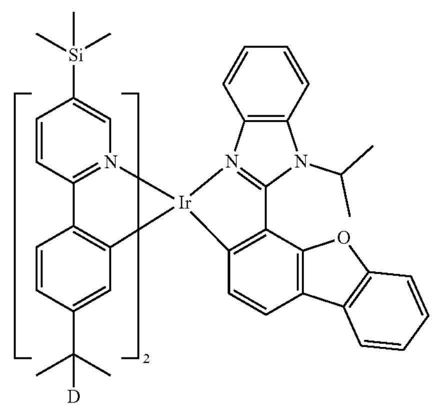
478
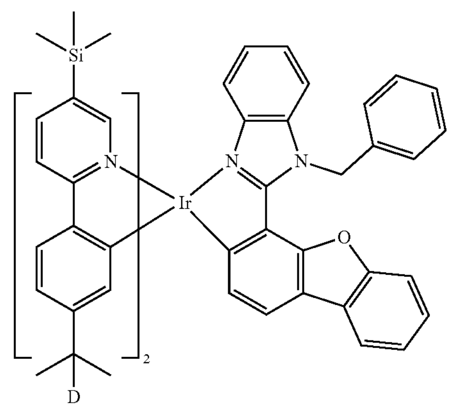
479
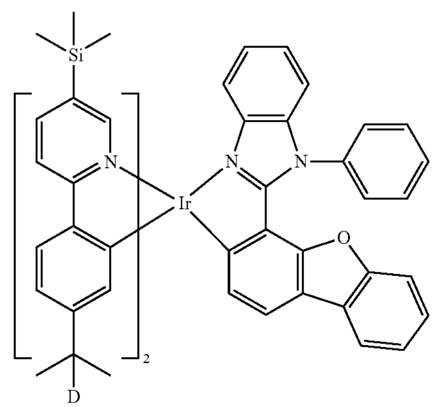

-continued
480
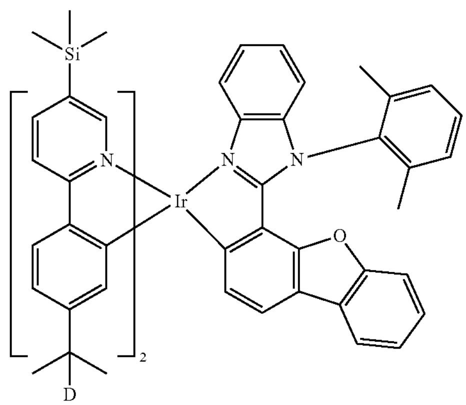
481
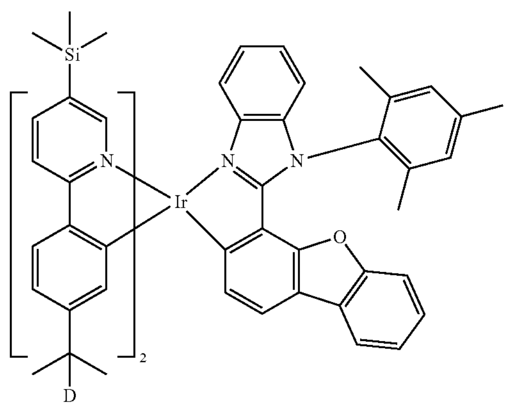
482
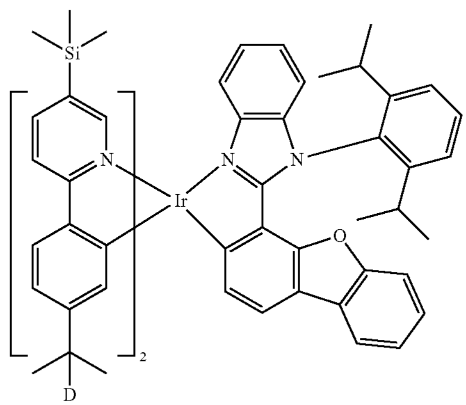
483
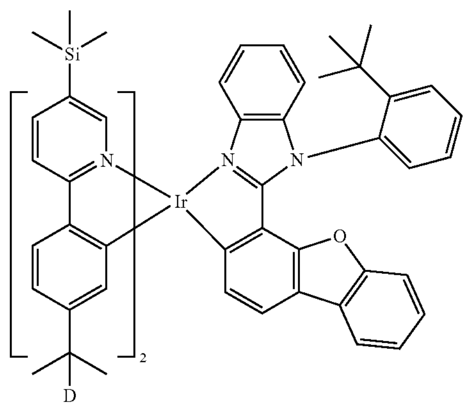
-continued
484
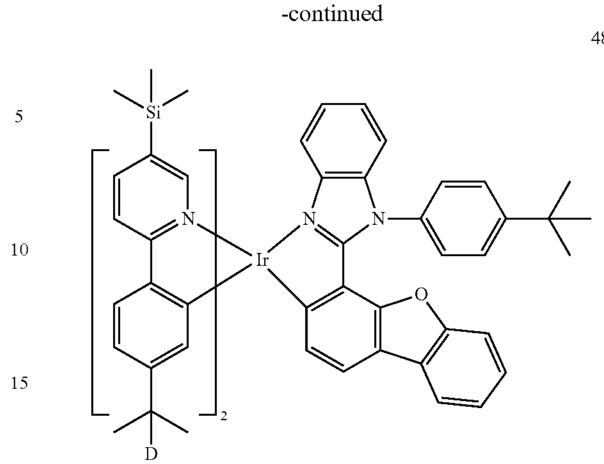
485
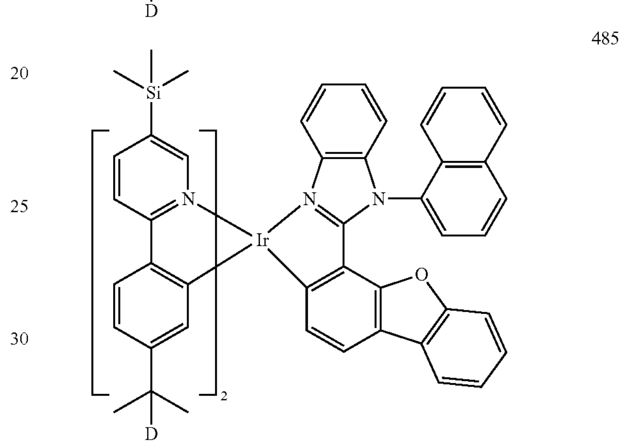
486
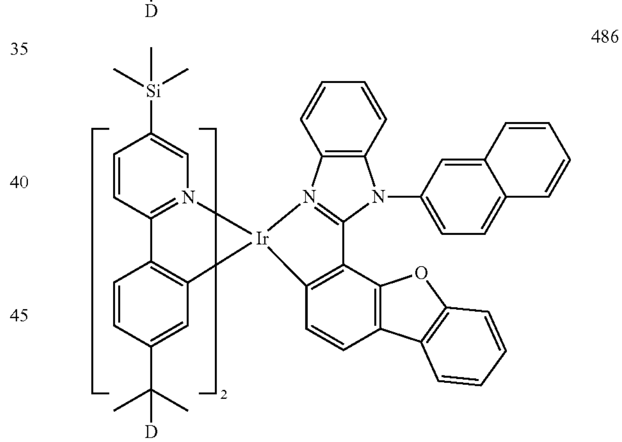
487
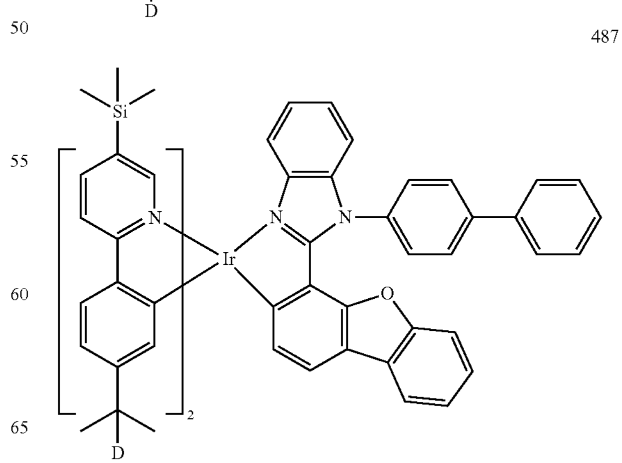

488
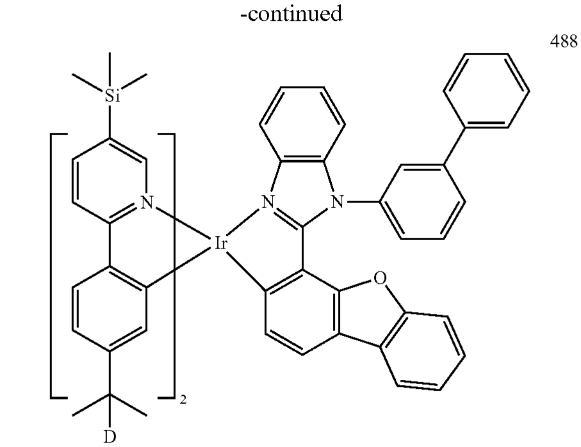
489
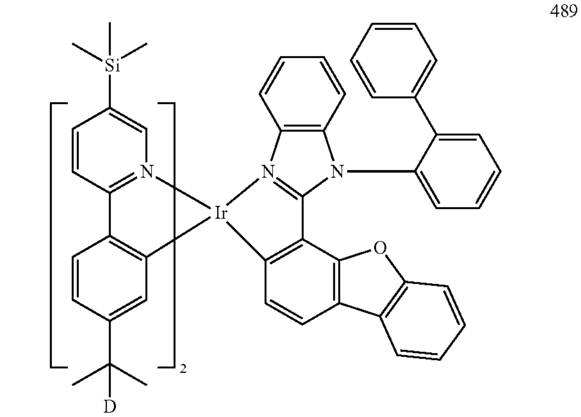
490
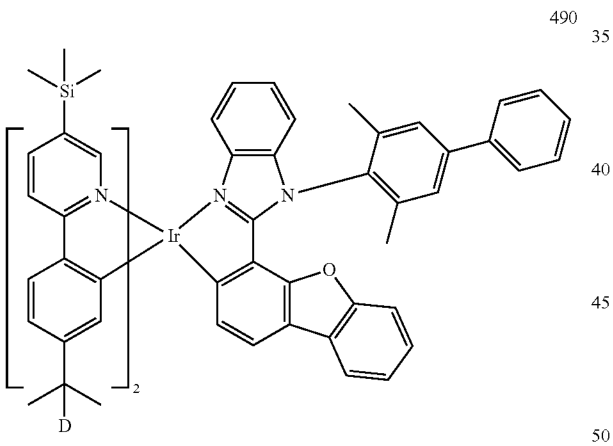
491
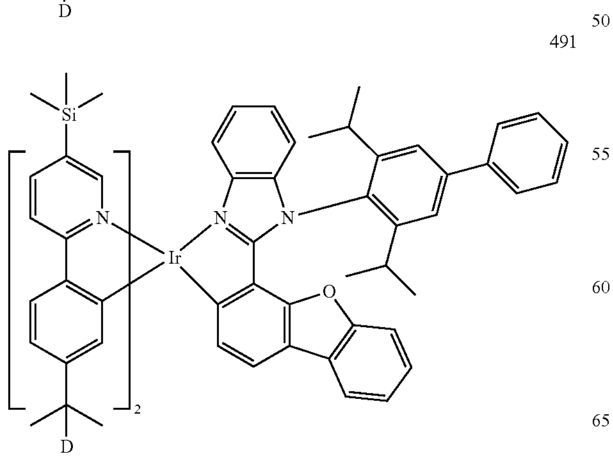
492
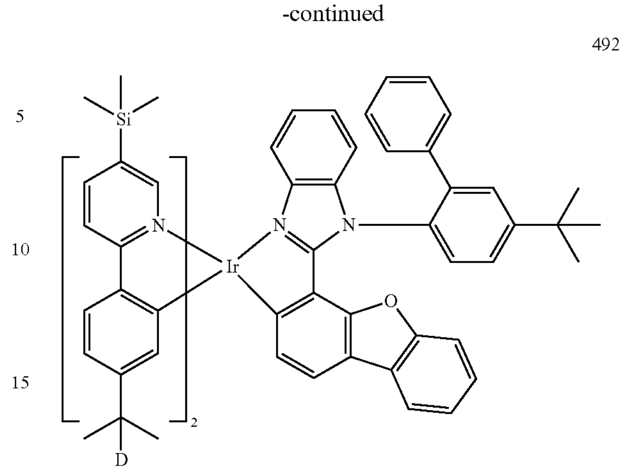
493
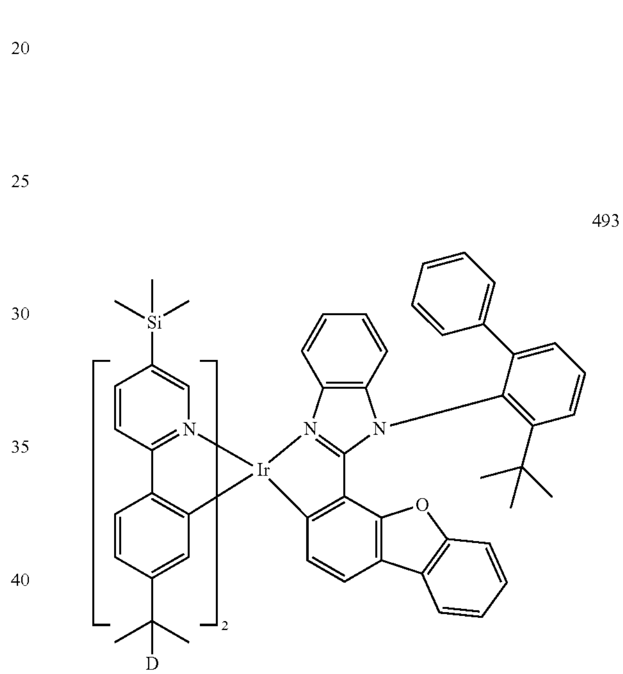
494
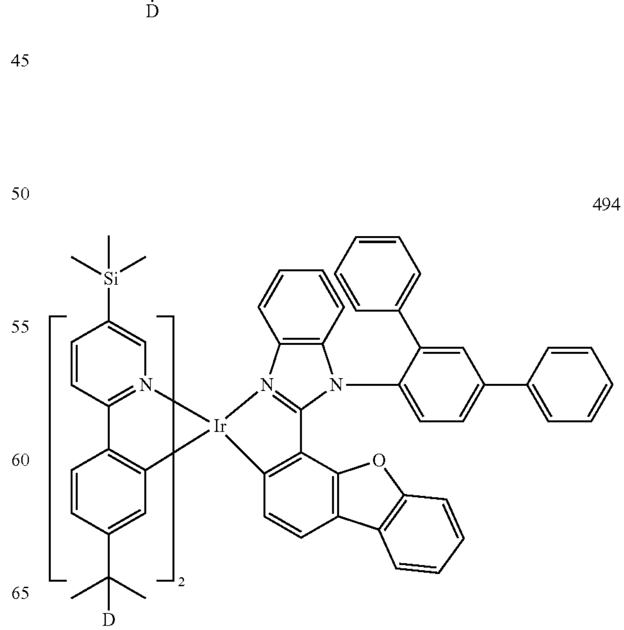

-continued
495
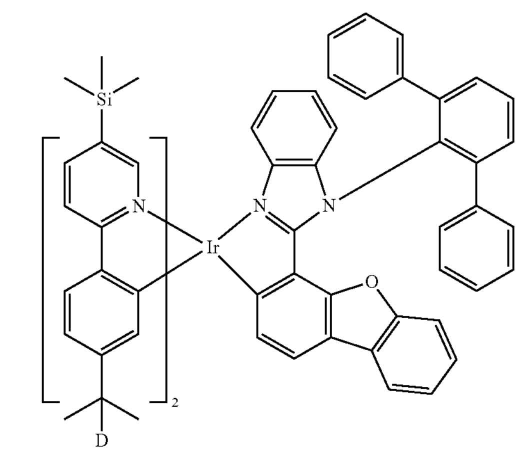
496
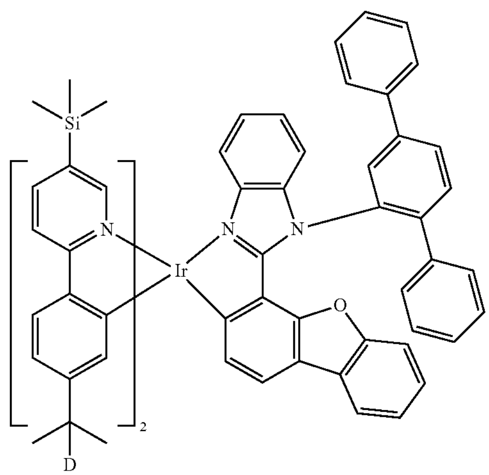
497
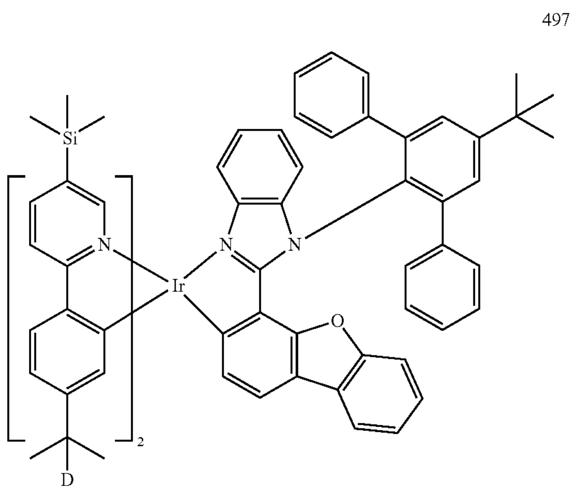
-continued
498
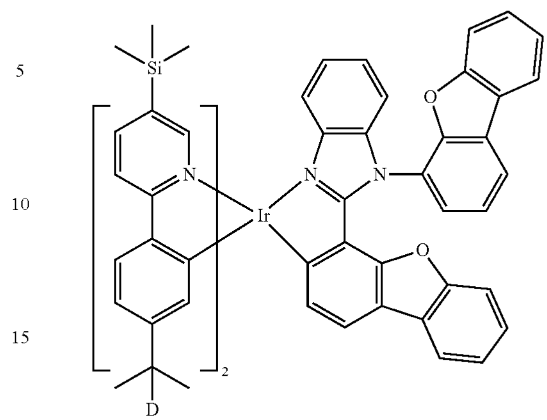
499
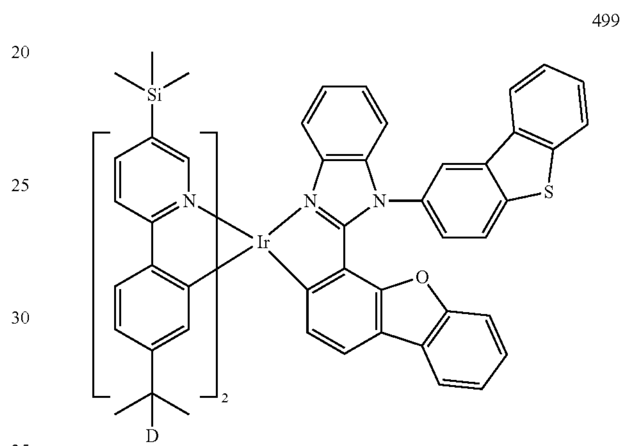
500
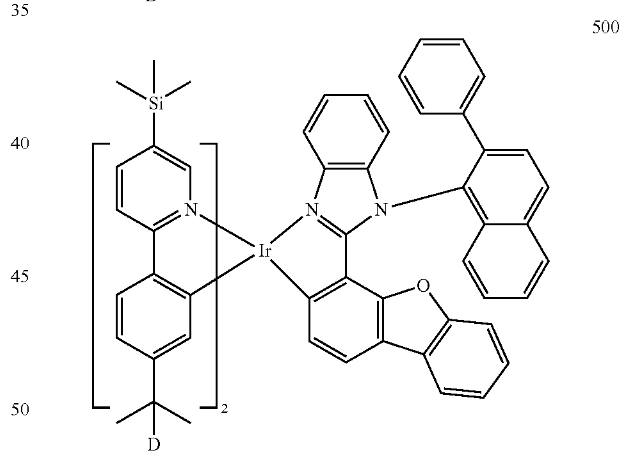
501
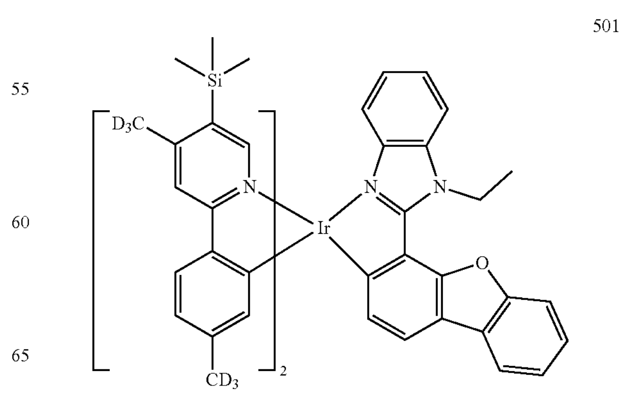

502
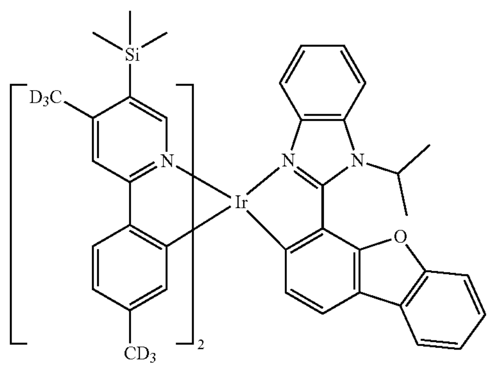
503
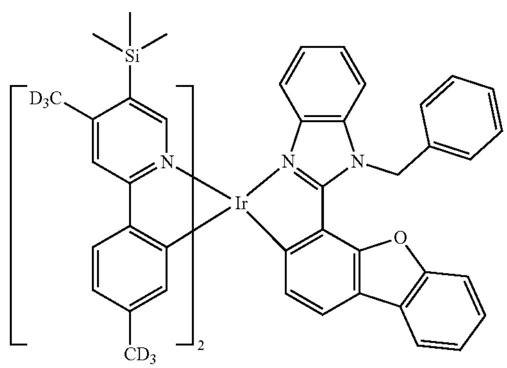
504
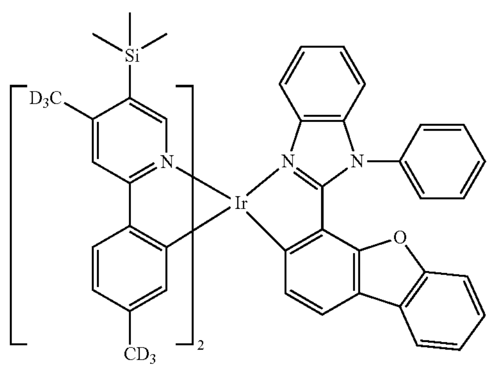
505
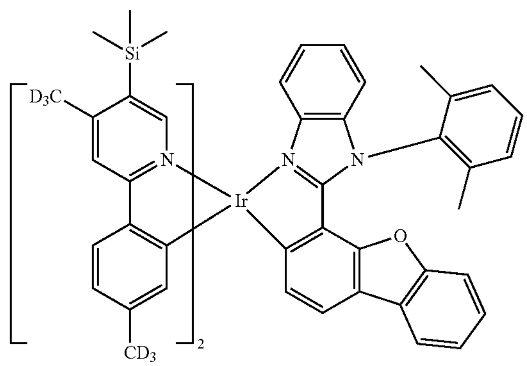
506
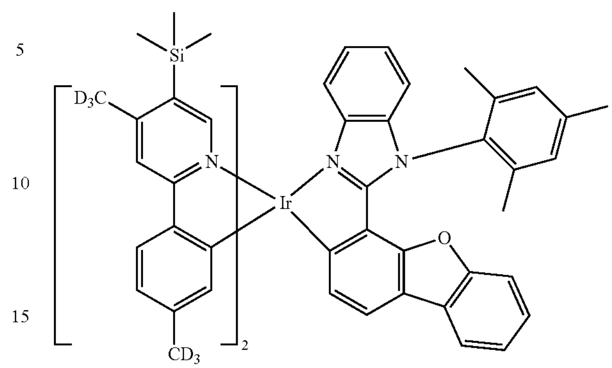
507
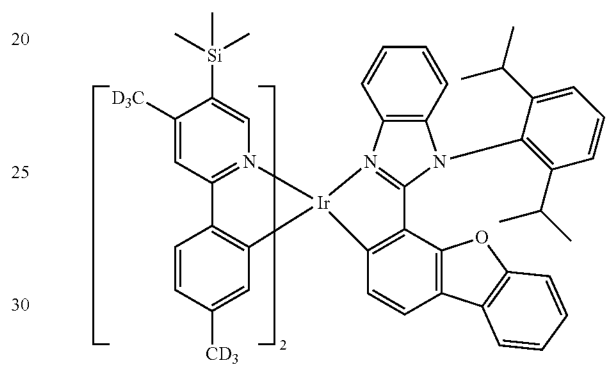
508
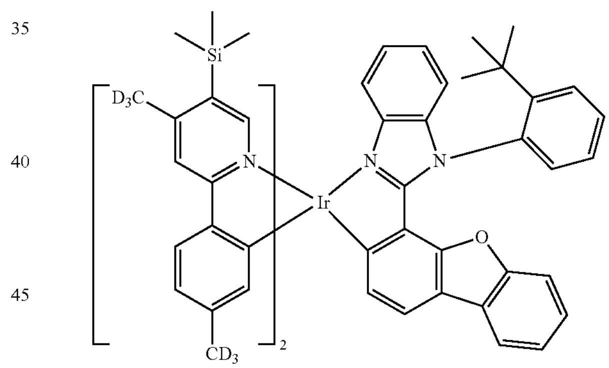
509
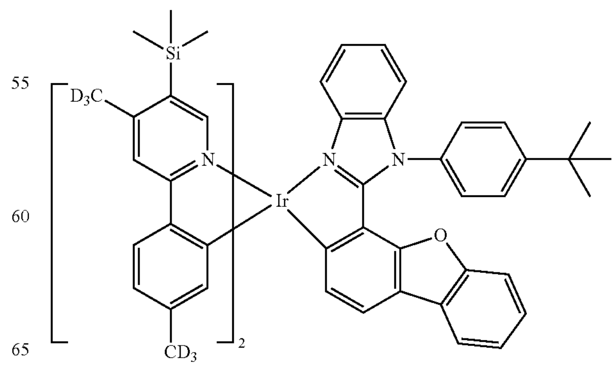

-continued
510
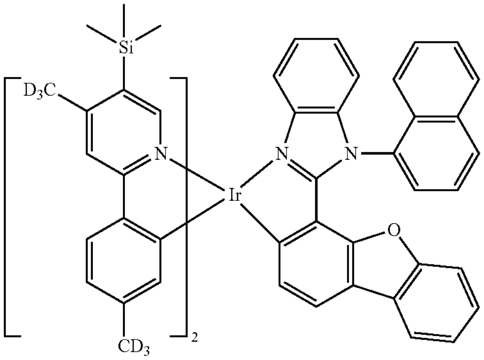
511
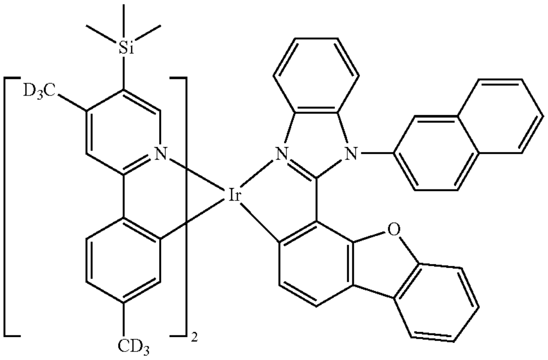
512
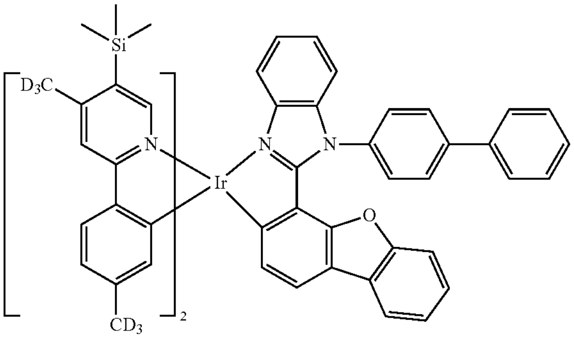
513
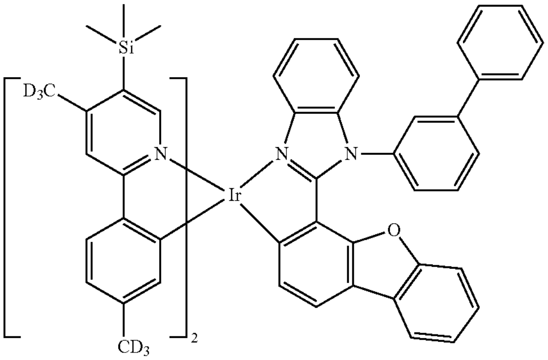
-continued
514
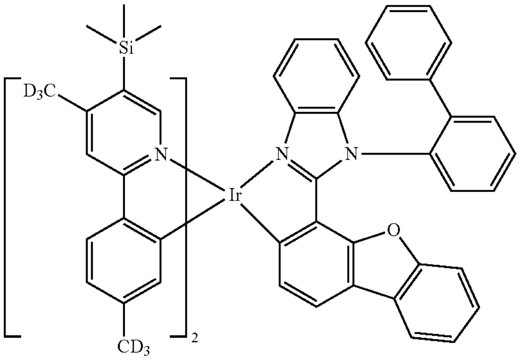
515
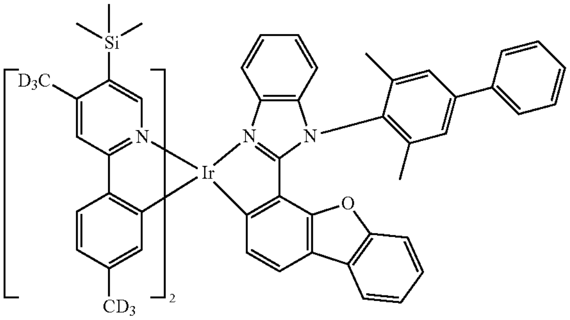
516
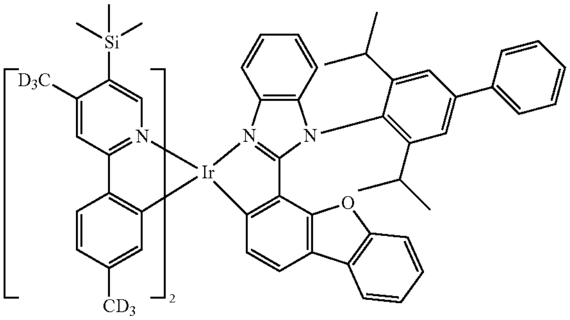
517
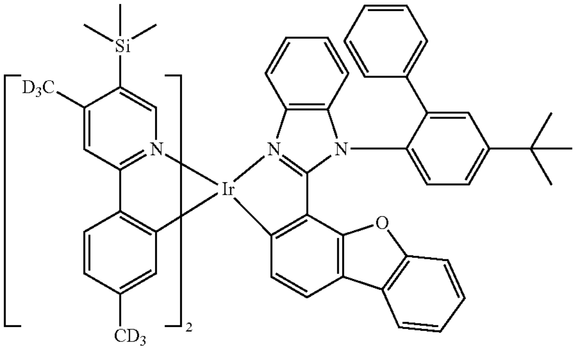

-continued
518
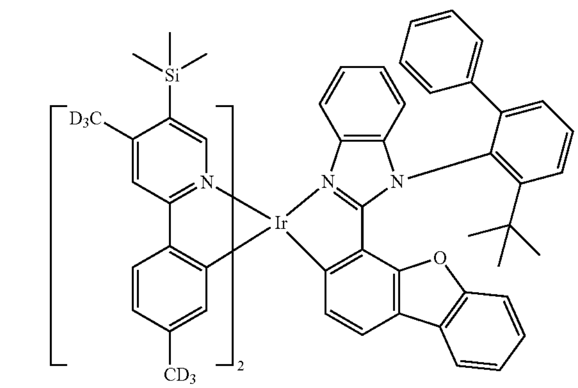
519
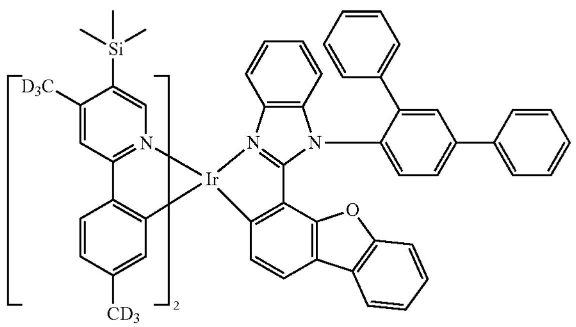
520
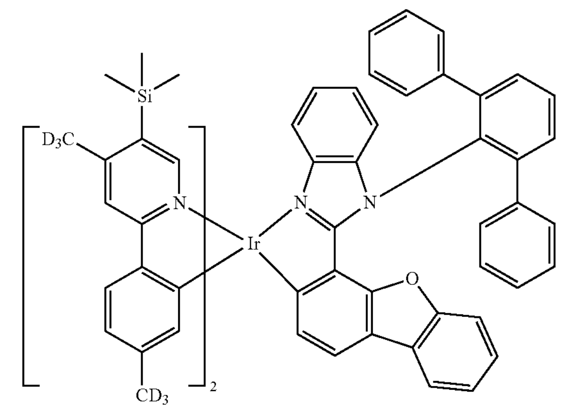
521
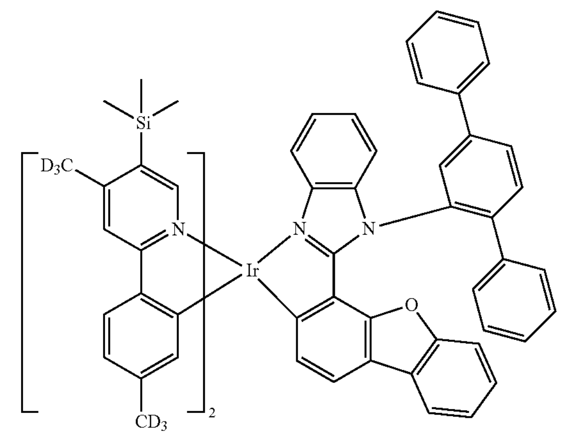
-continued
522
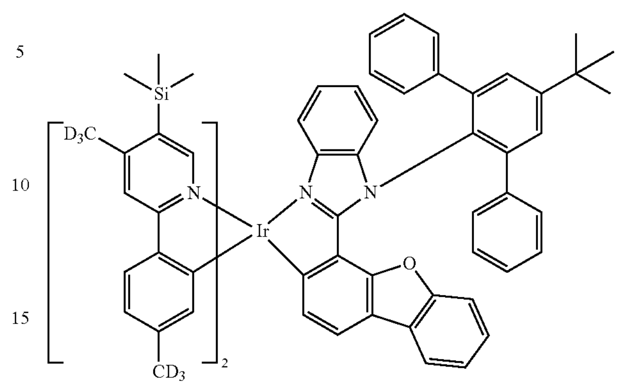
523
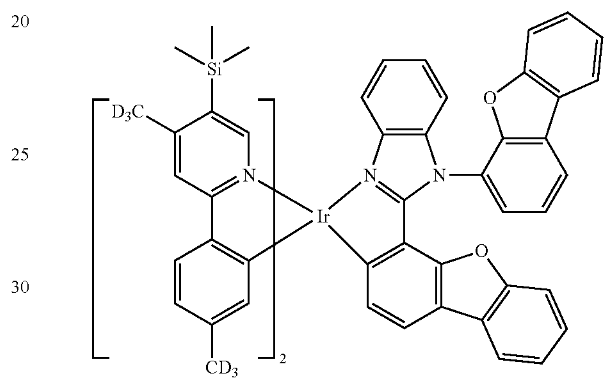
524
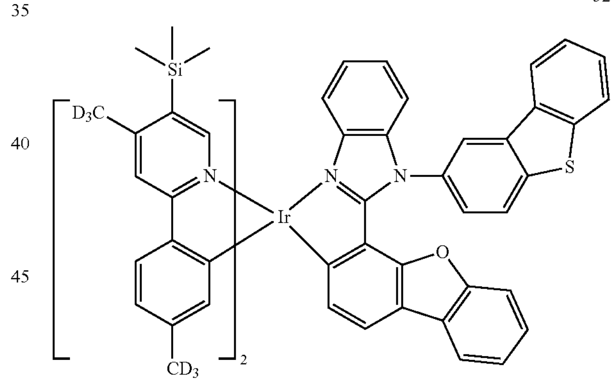
525
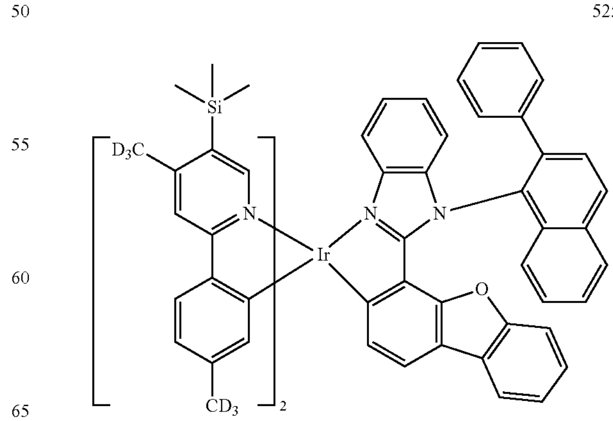

-continued
526
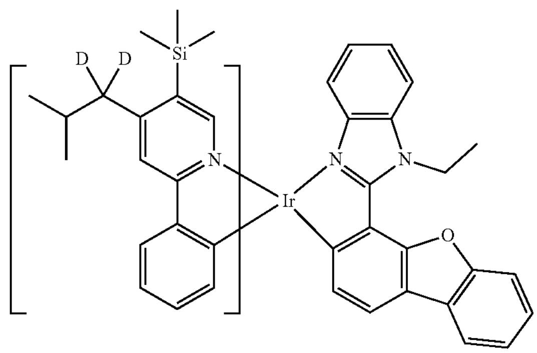
527
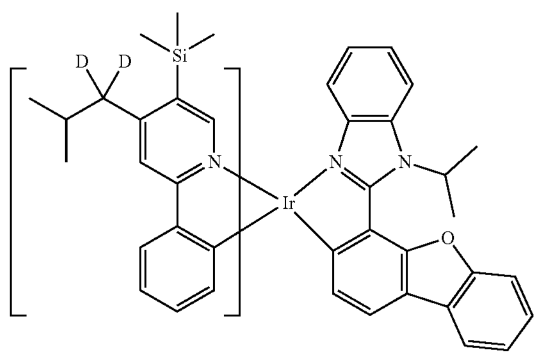
528
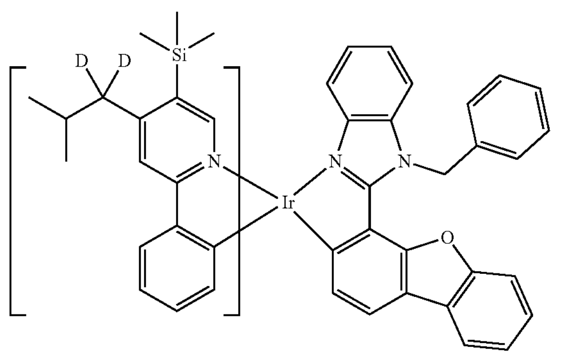
529
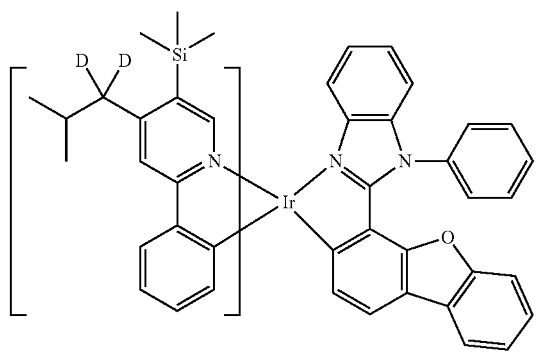
-continued
530
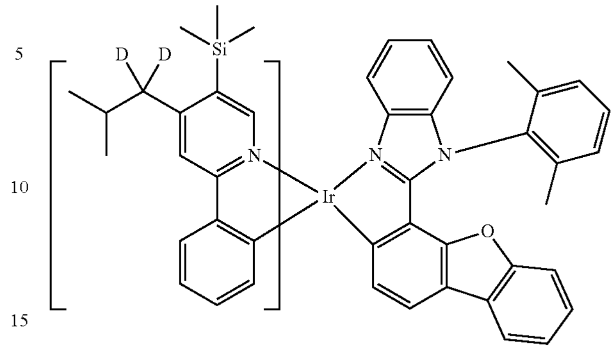
531
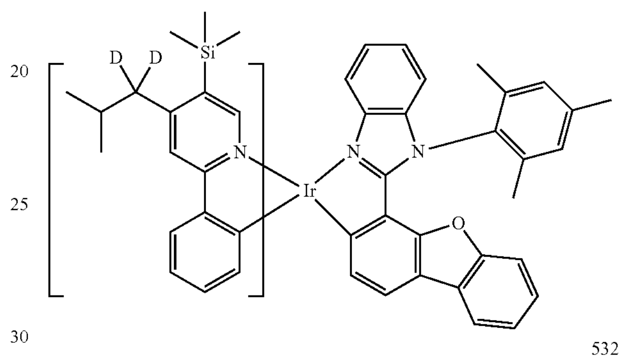
532
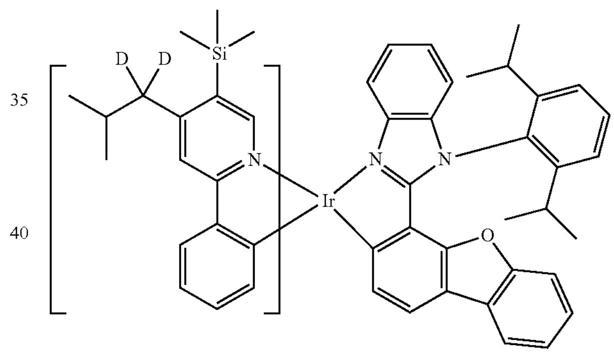
533
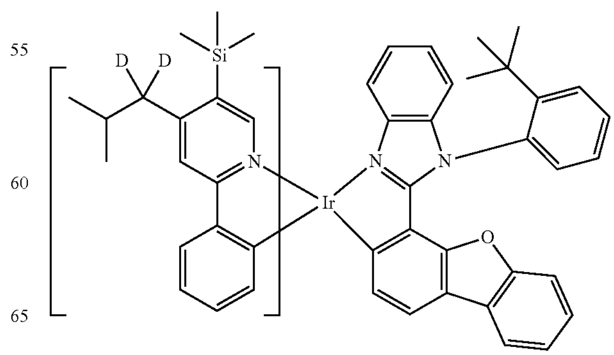

534
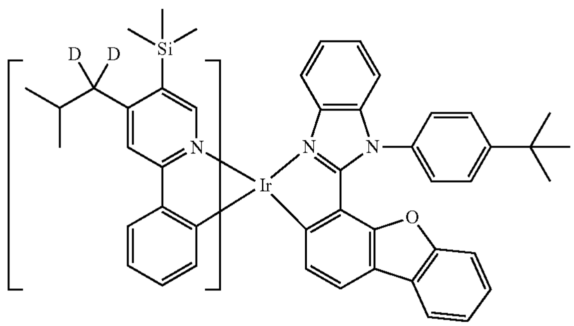
535
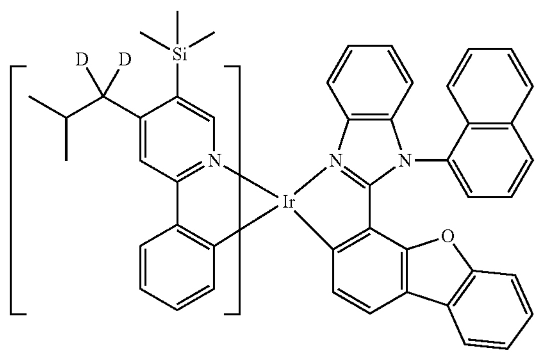
536
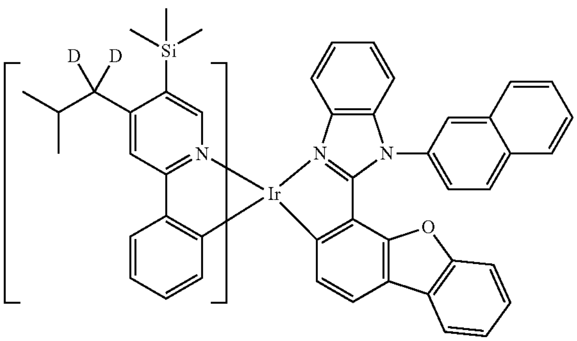
537
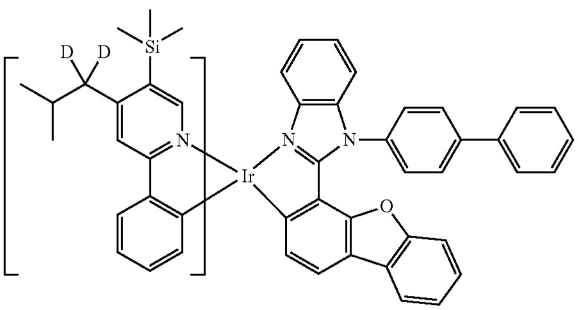
538
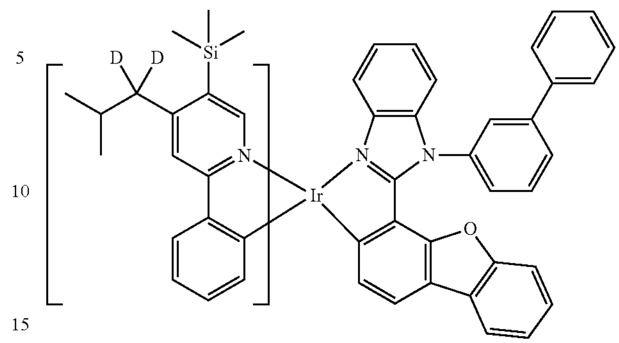
539
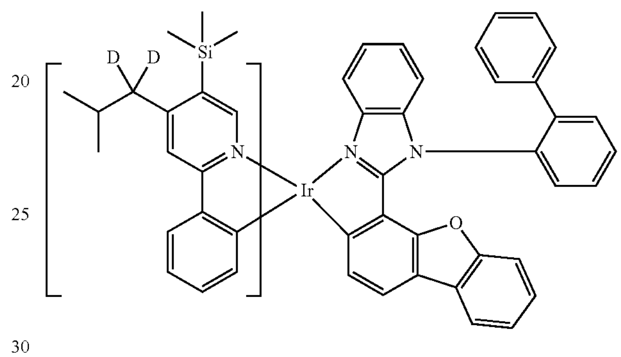
540
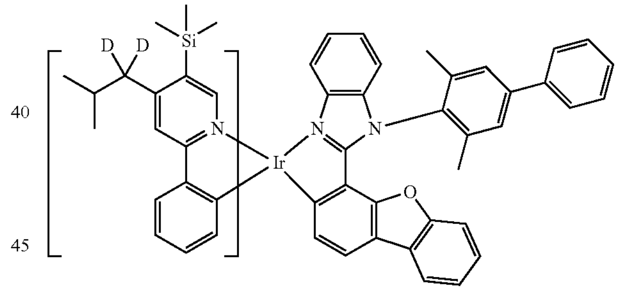
541
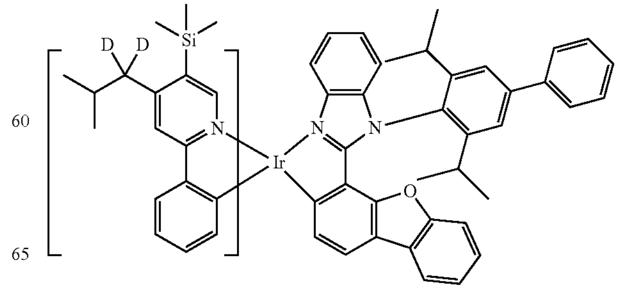

-continued
542
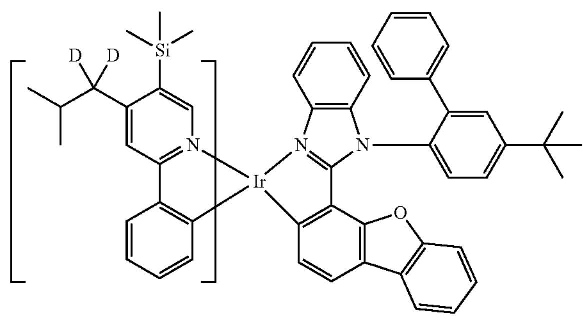
543
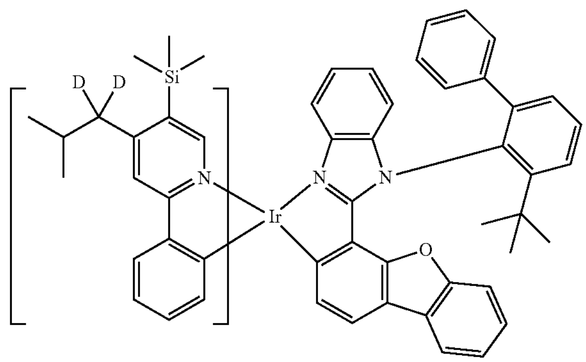
544
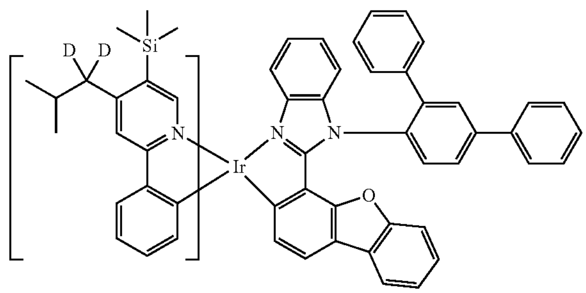
545
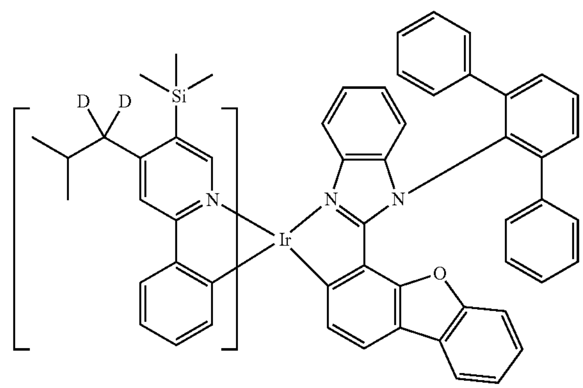
-continued
546
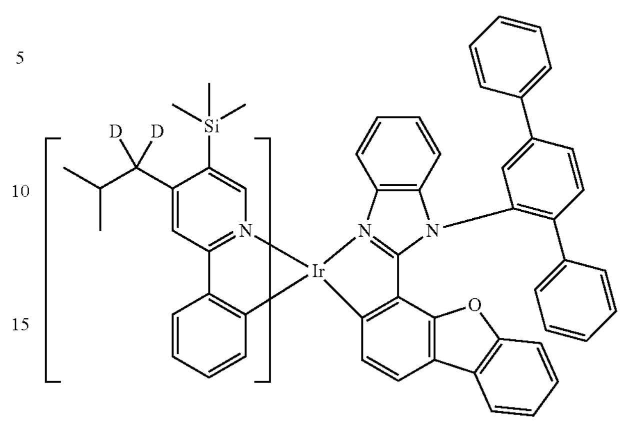
547
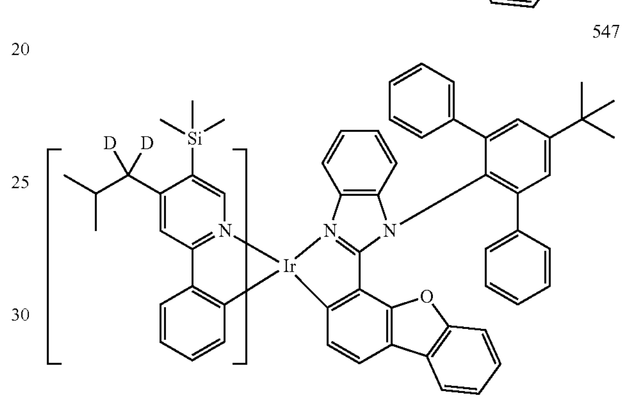
548
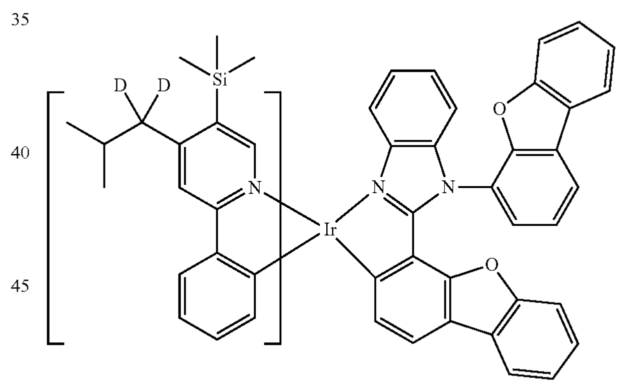
549
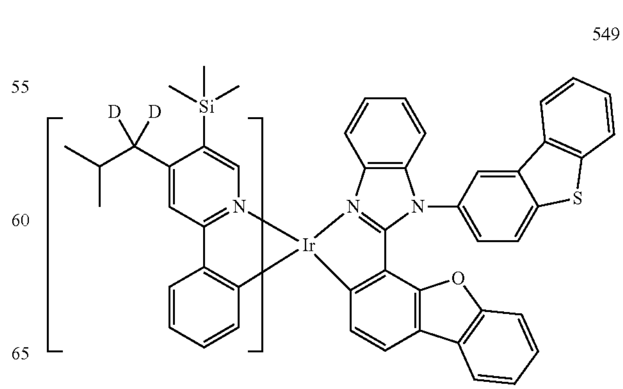

550
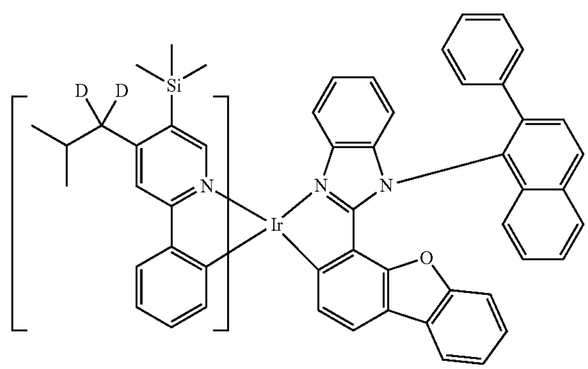
551
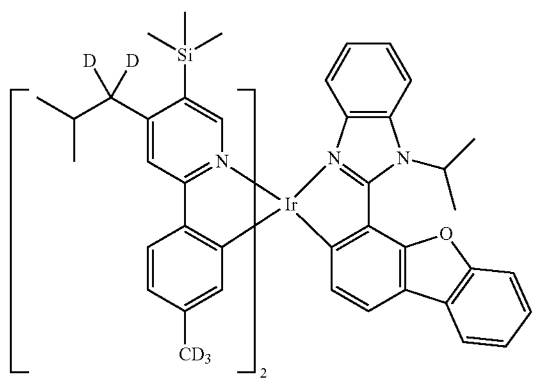
552
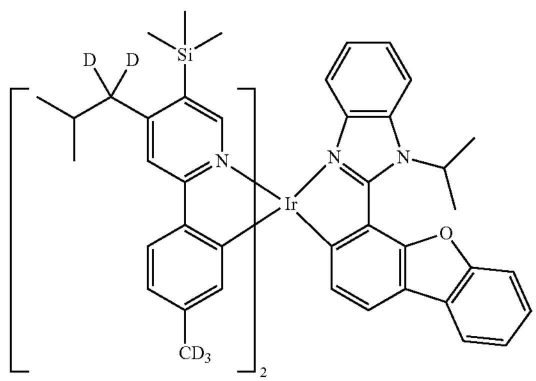
553
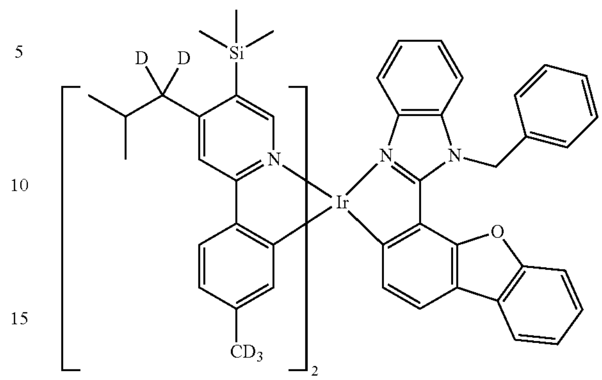
554
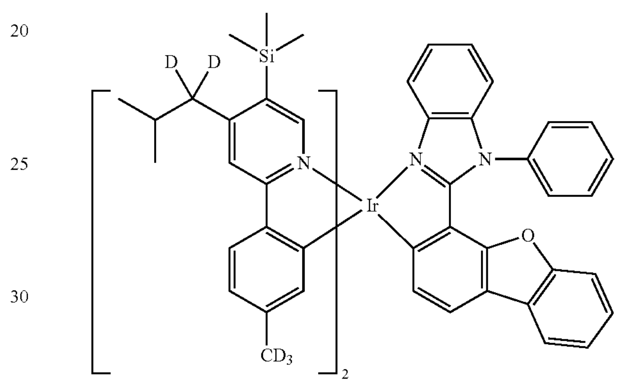
555
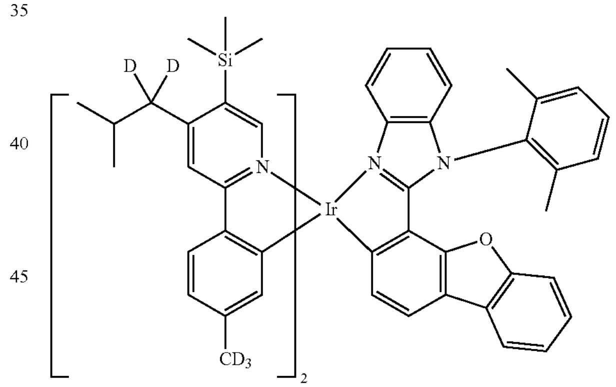
556
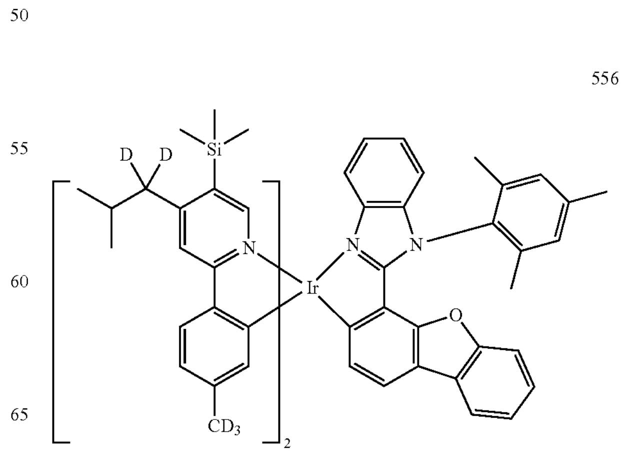

-continued
557
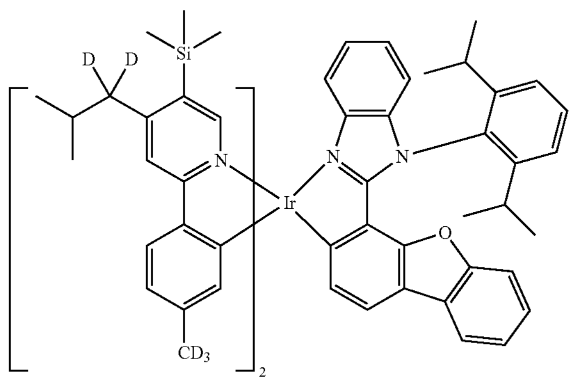
558
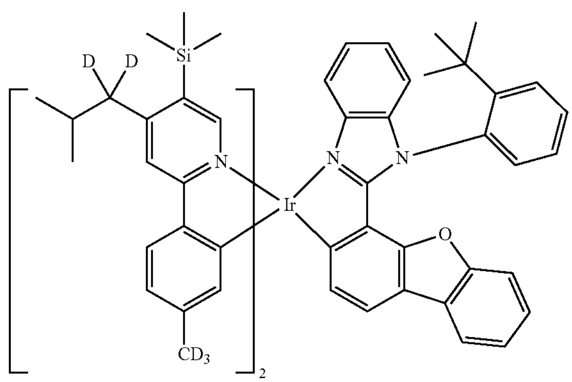
559
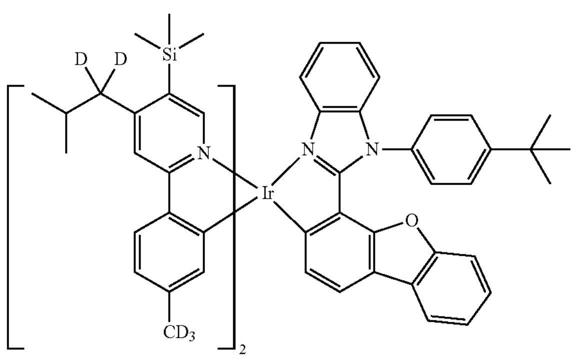
560
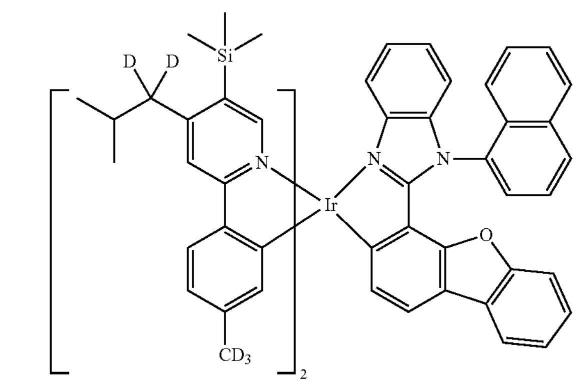
-continued
561
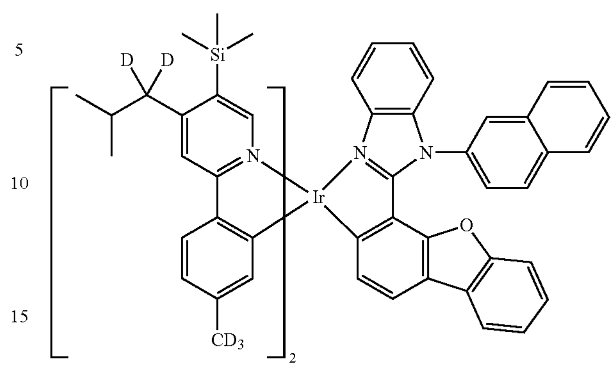
562
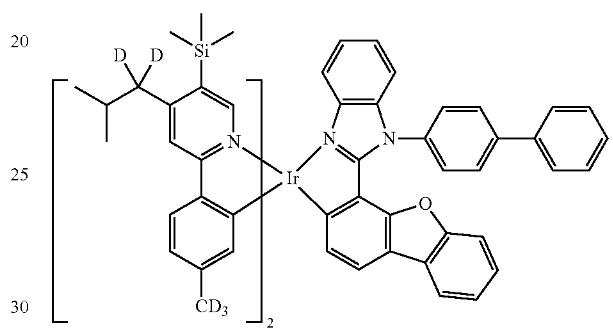
563
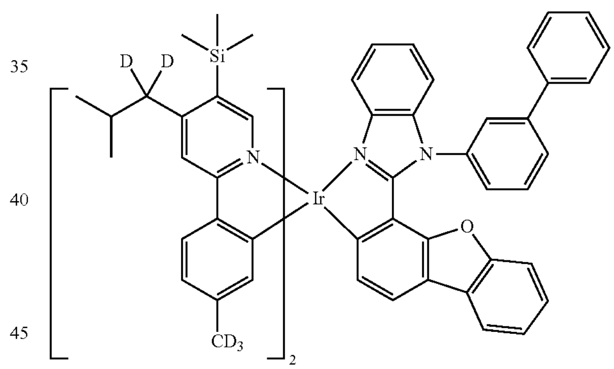
564
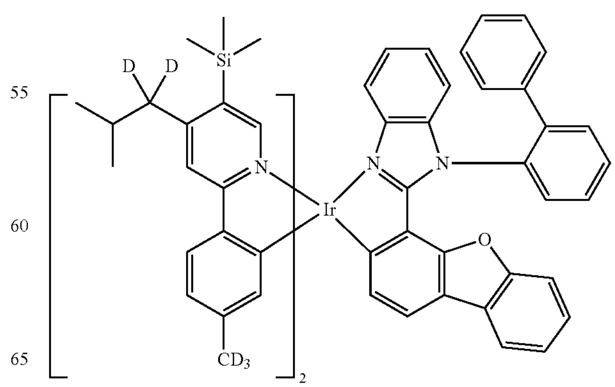

565
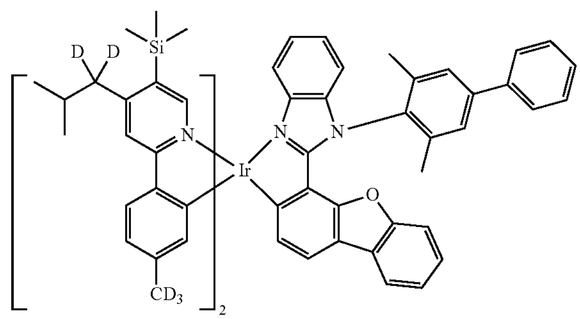
566
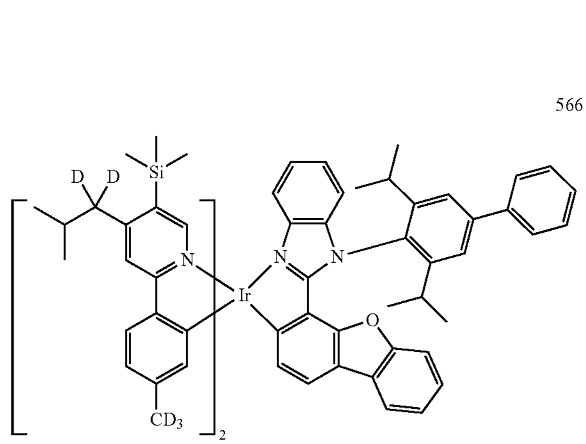
567
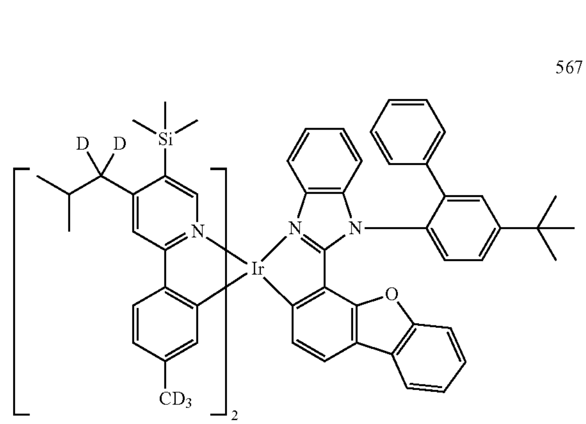
568
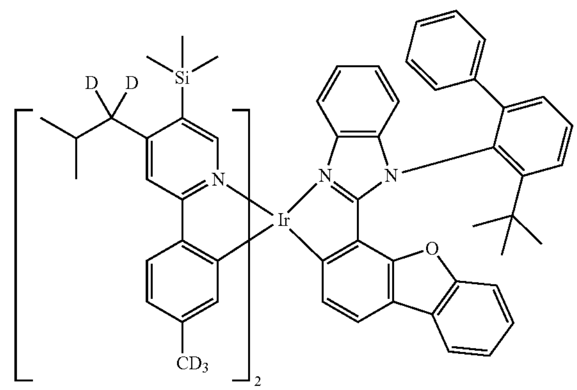
569
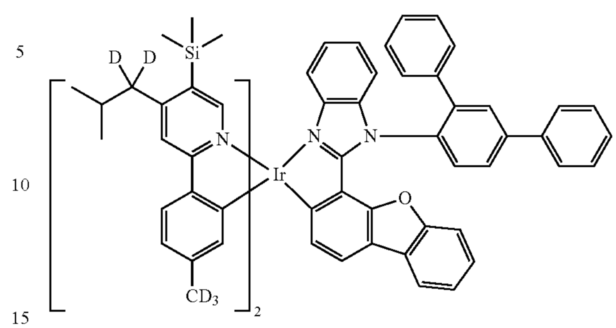
570
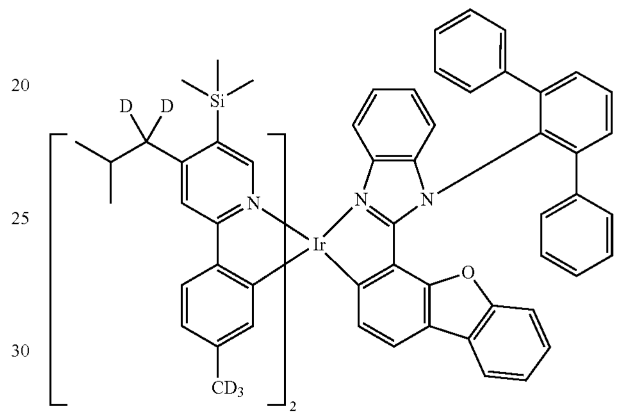
571
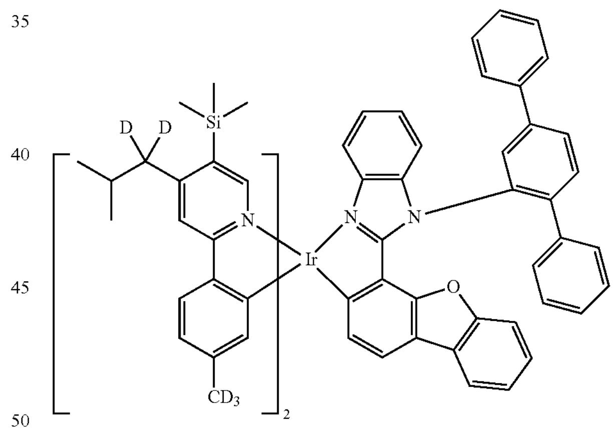
572
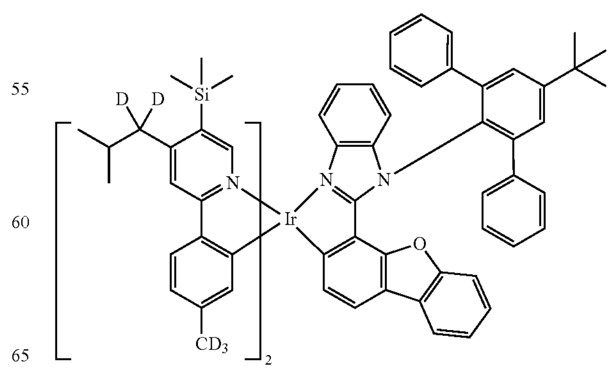

573
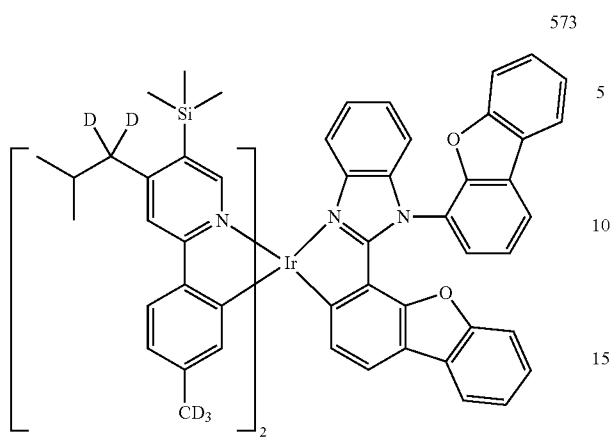
574
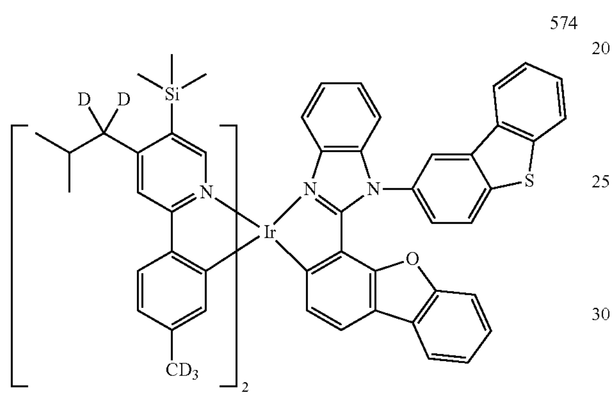
575
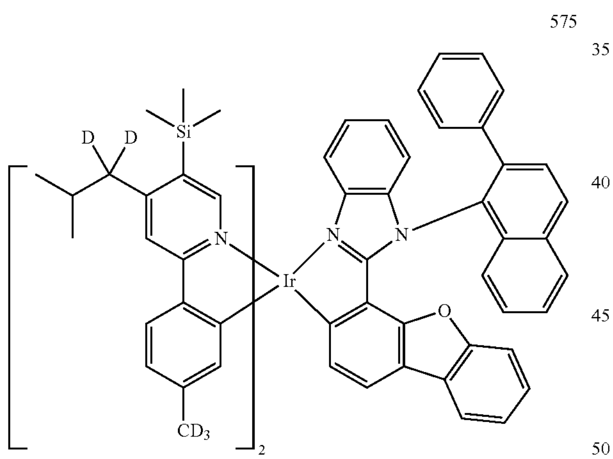
576
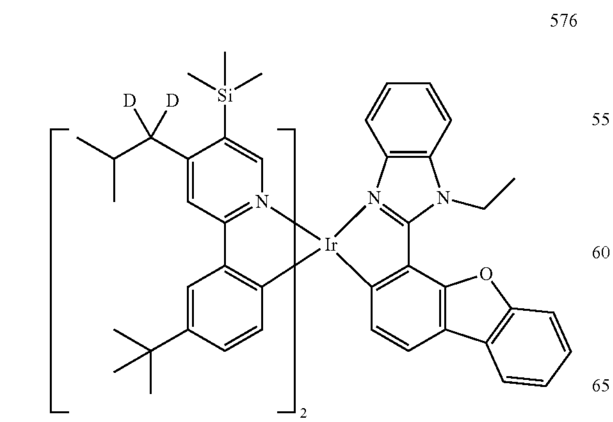
577
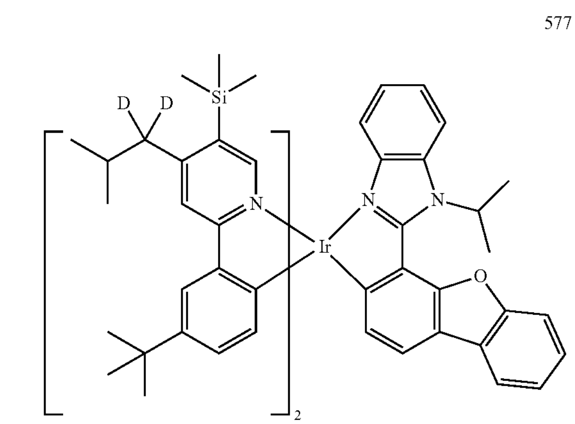
578
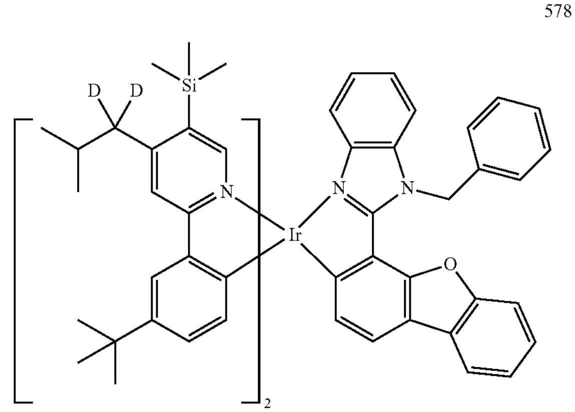
579
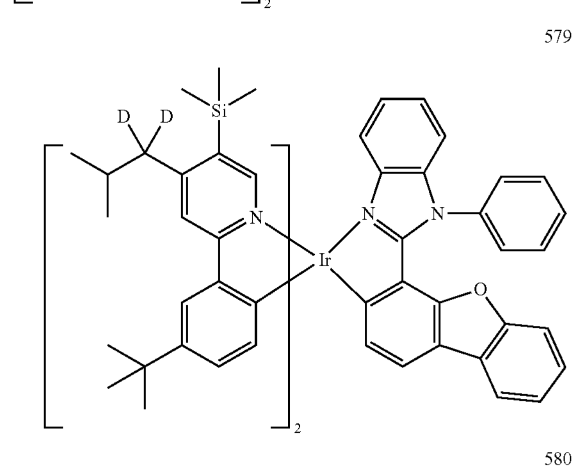
580
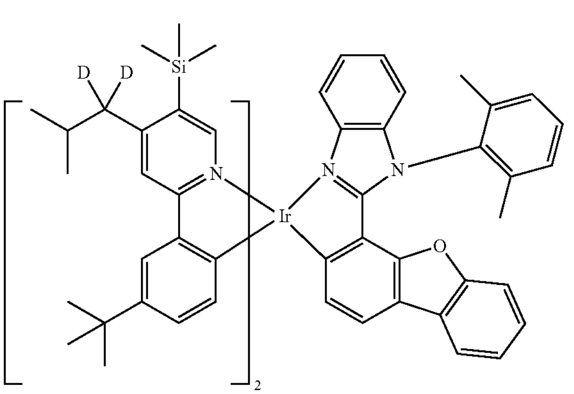

581
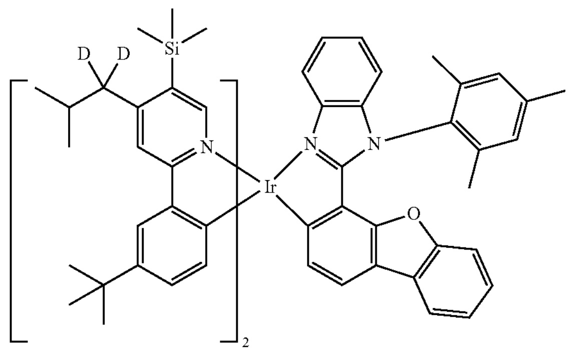
582
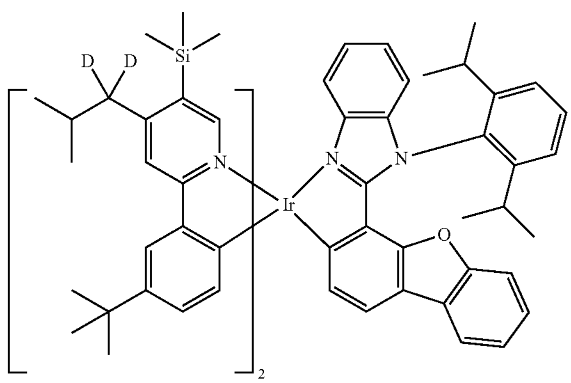
583
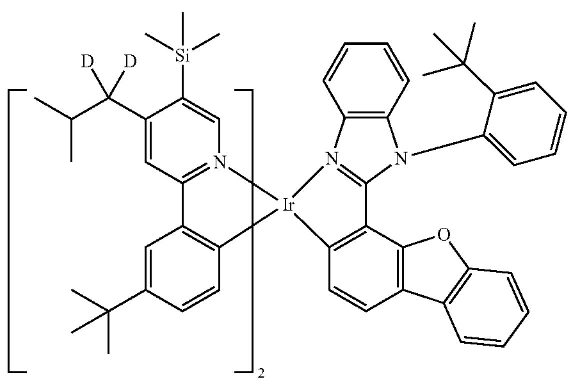
584
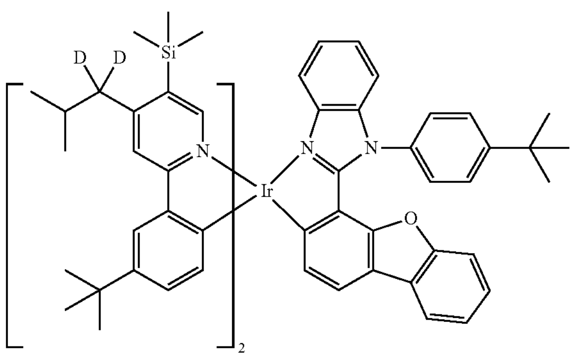
585
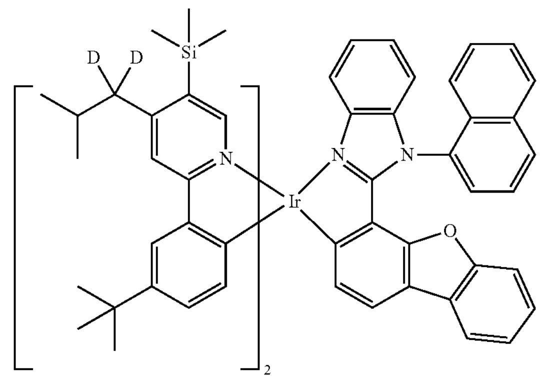
586
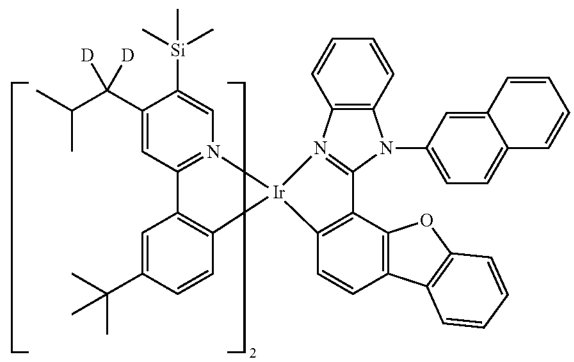
587
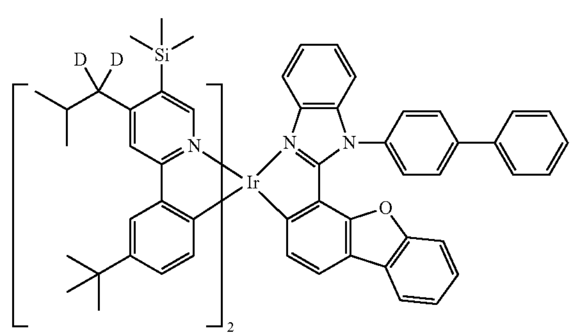
588
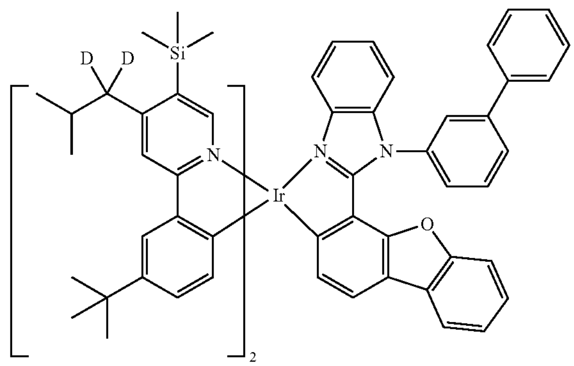

589
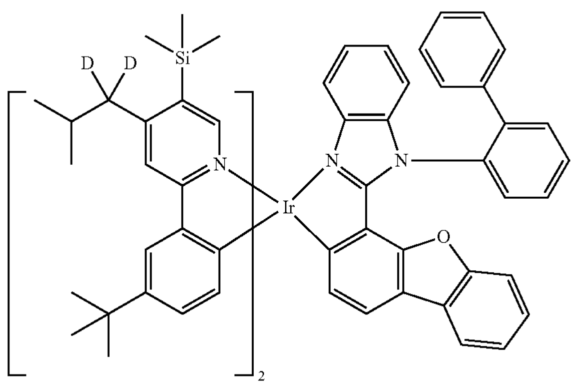
590
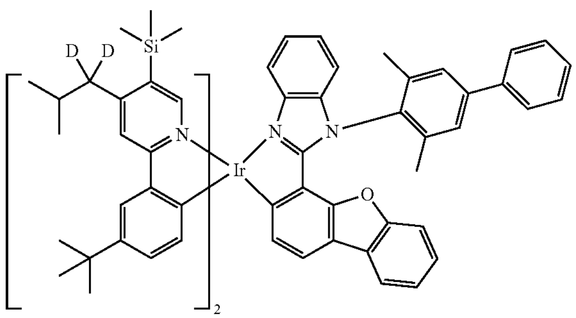
591
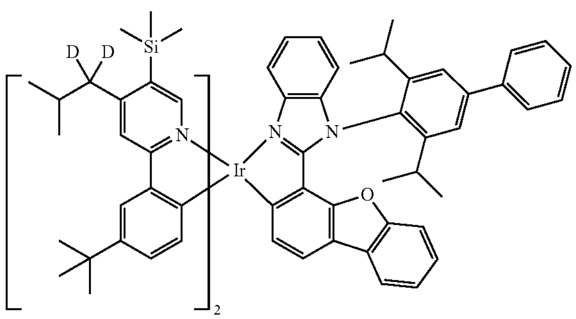
592
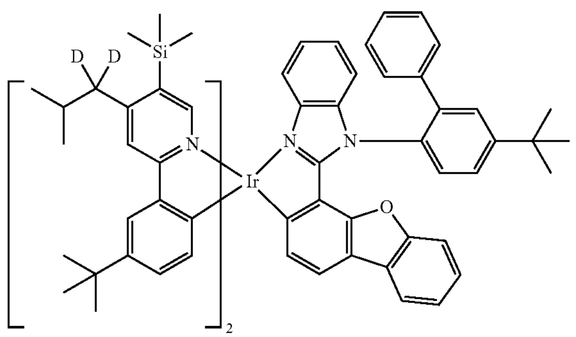
593
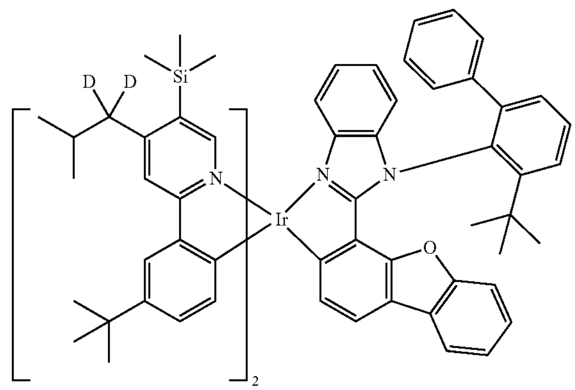
594
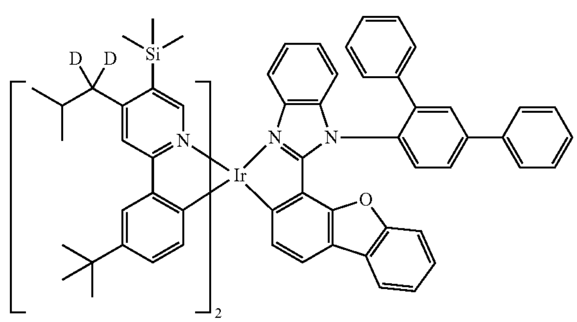
595
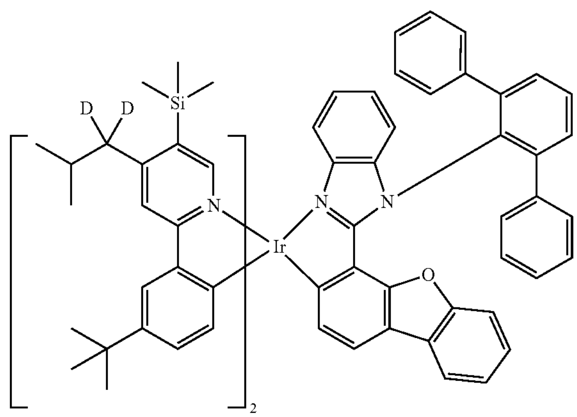
596
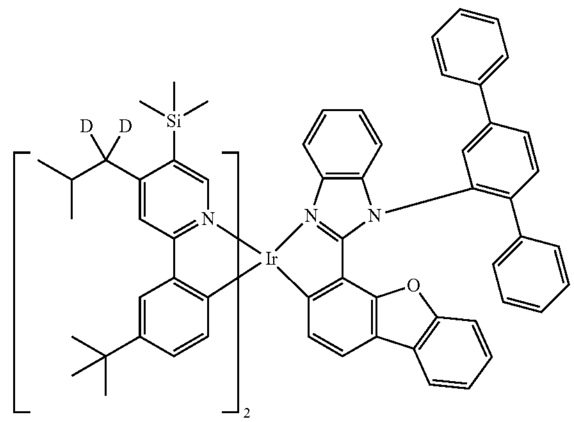

-continued
597
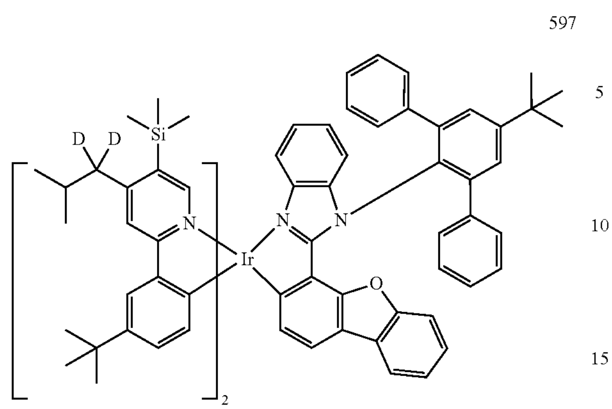
598
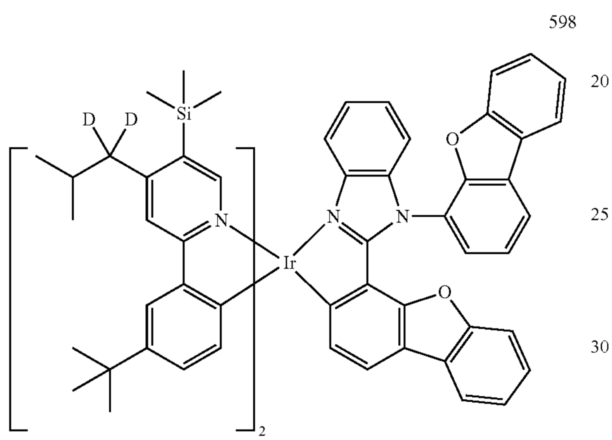
599
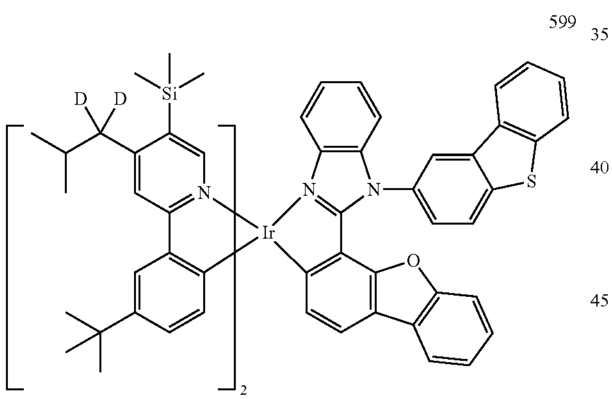
600
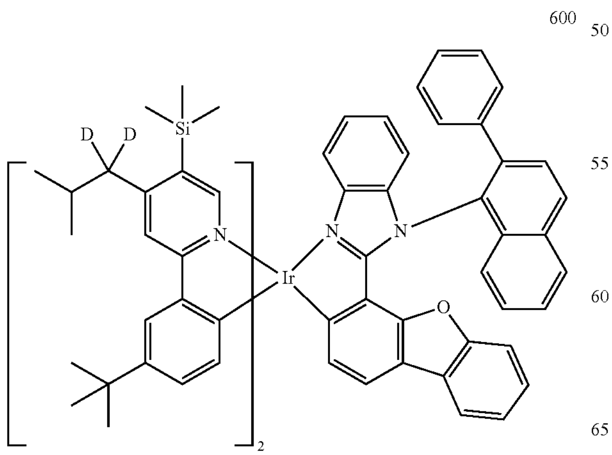
-continued
601
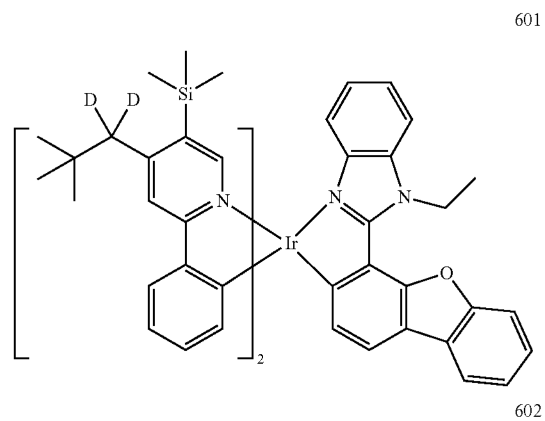
602
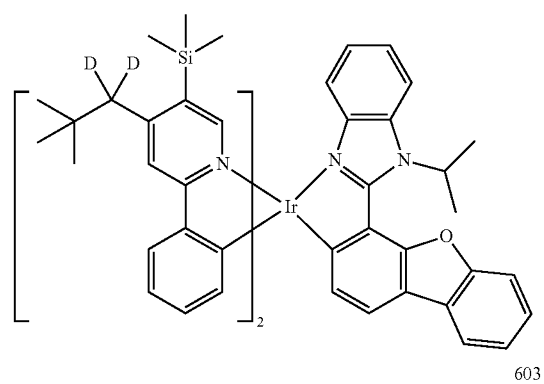
603
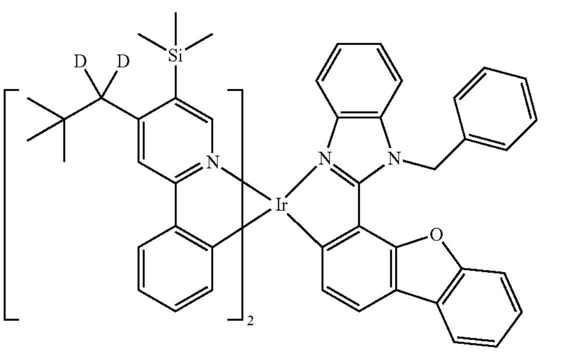
604
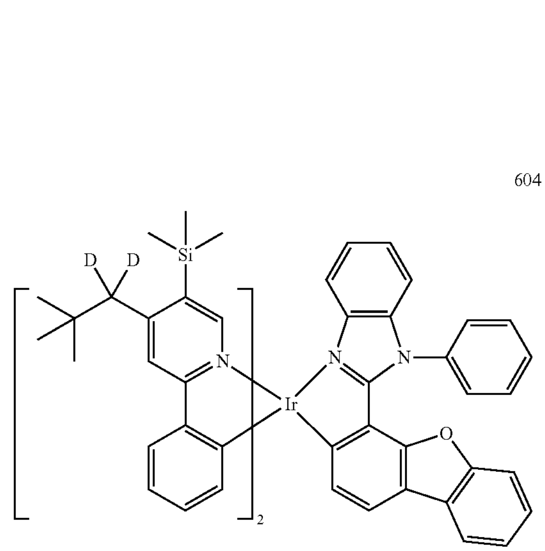

605
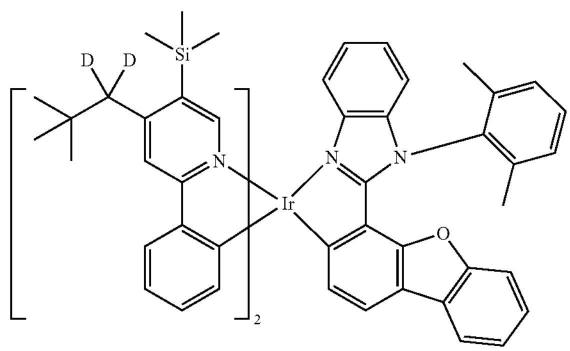
606
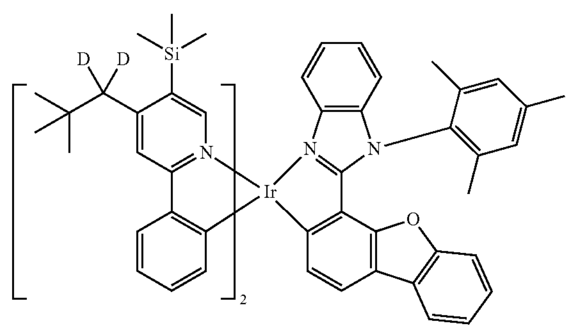
607
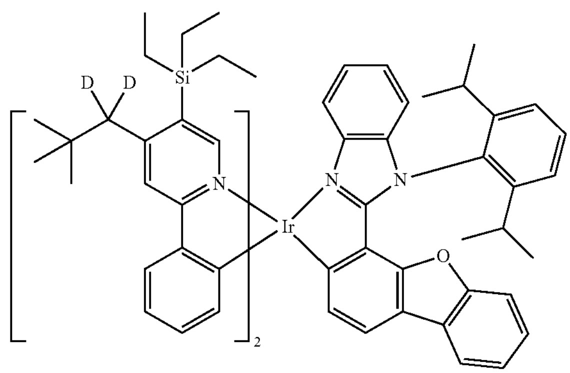
608
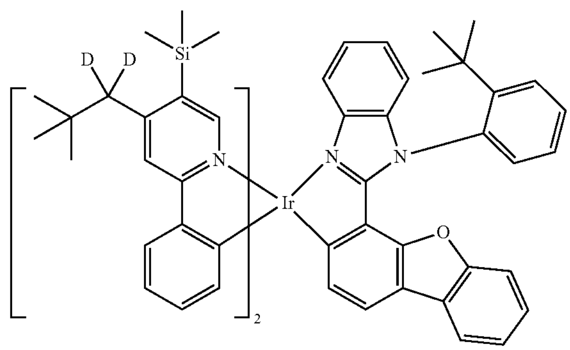
609
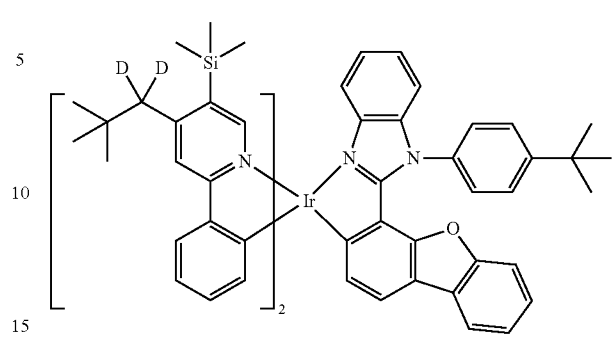
610
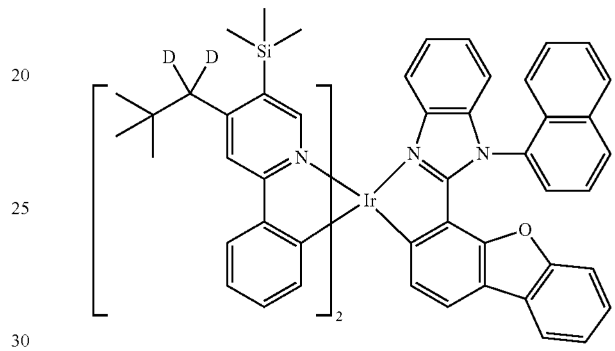
611
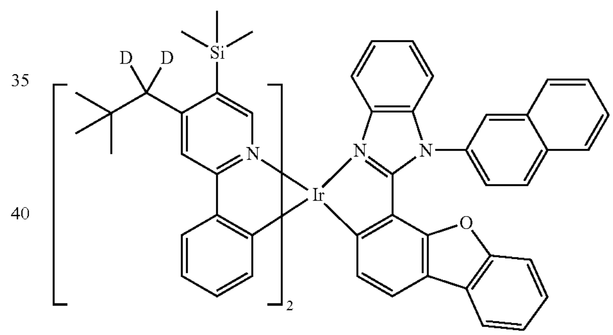
612
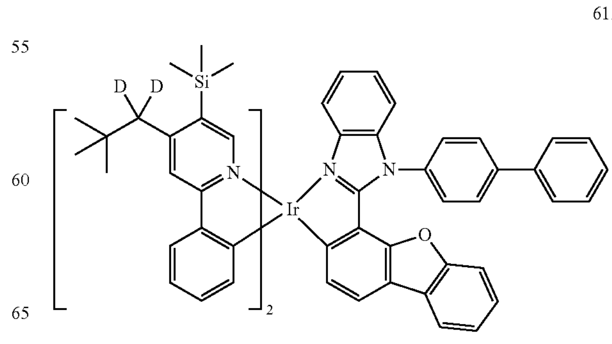

-continued
613
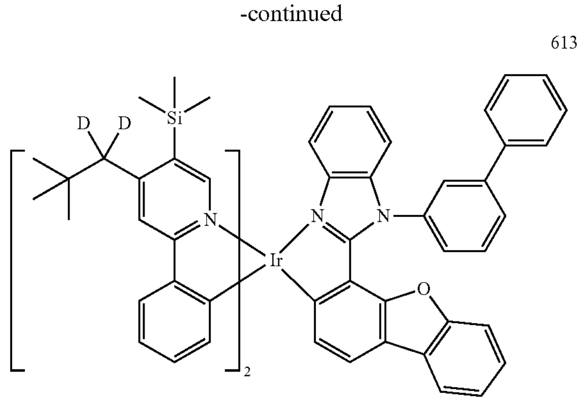
614
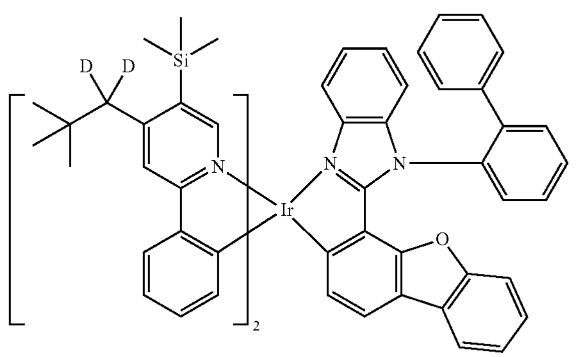
615
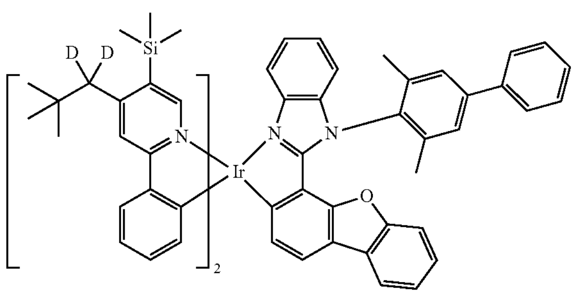
616
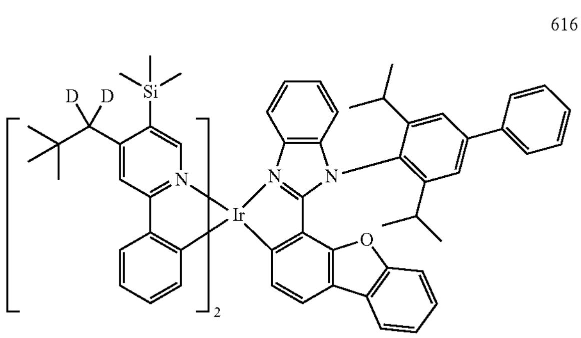
-continued
617
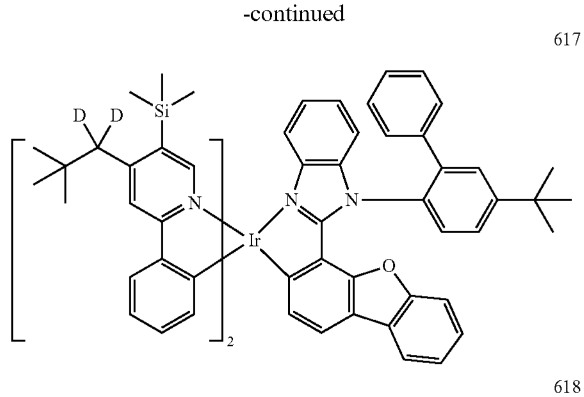
618
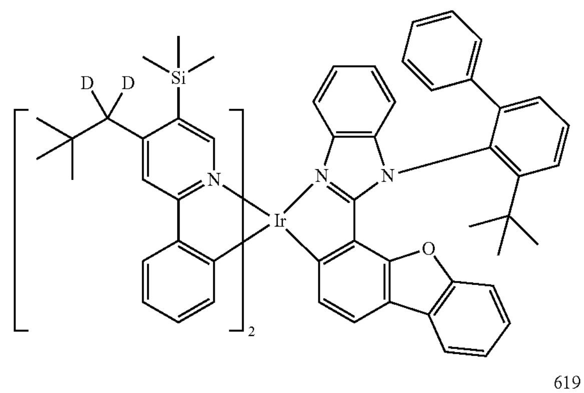
619
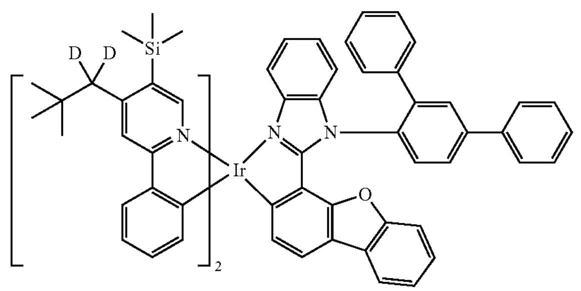
620
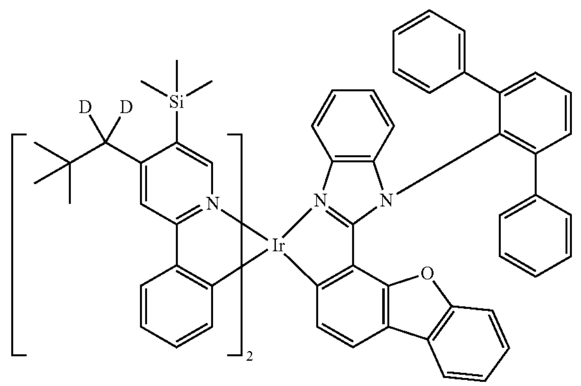

-continued
621
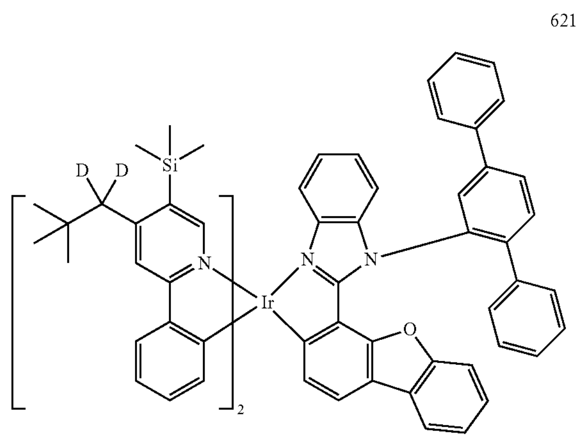
622
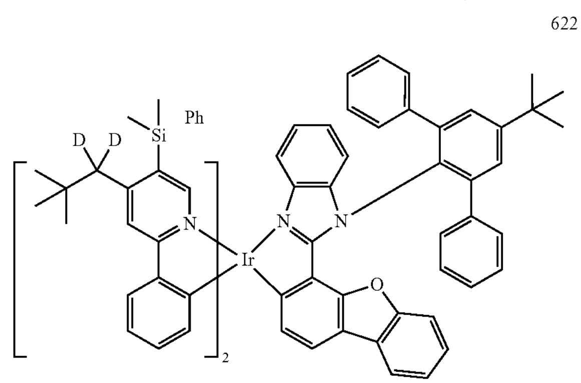
623
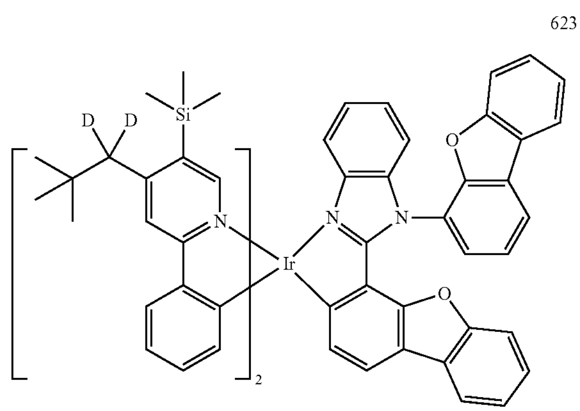
624
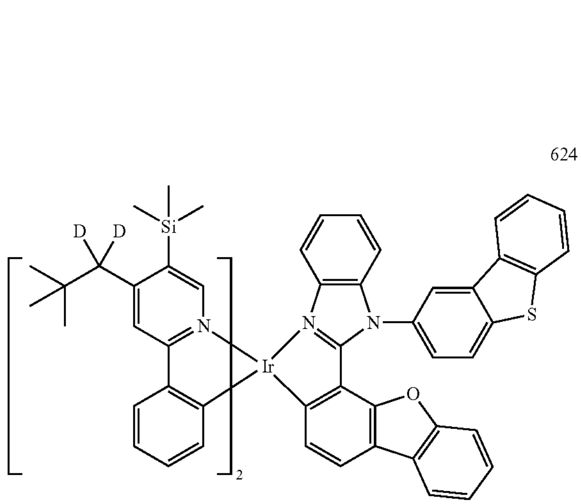
-continued
625
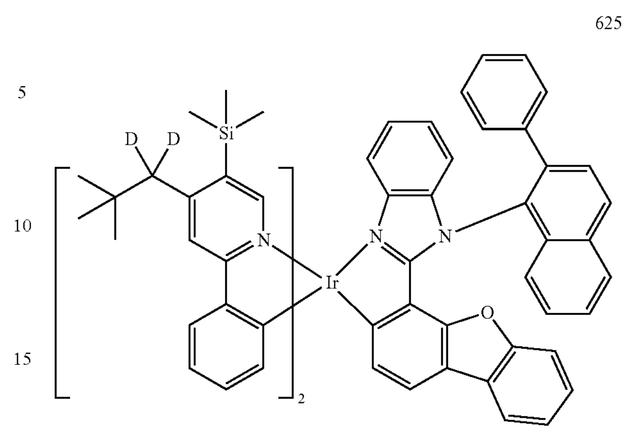
626
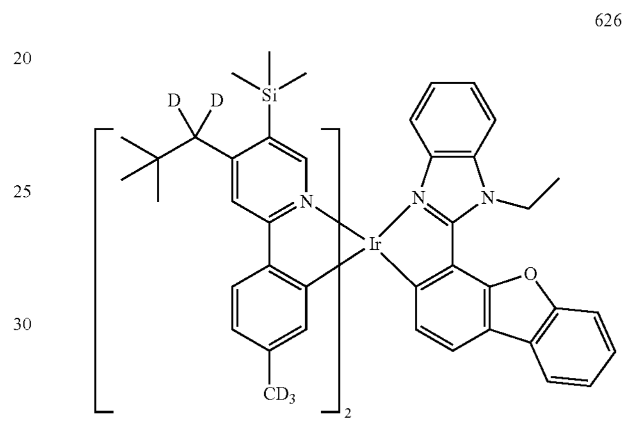
627
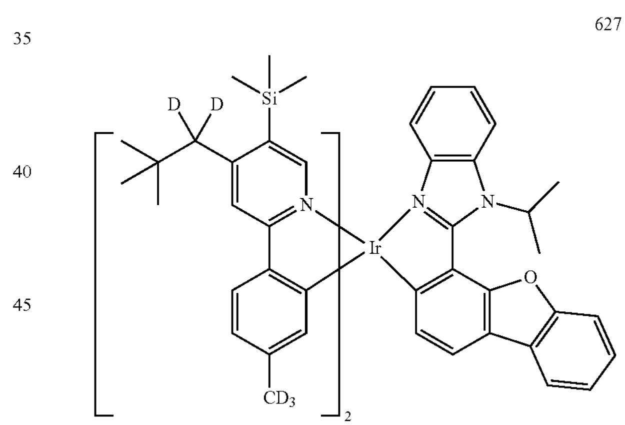
628
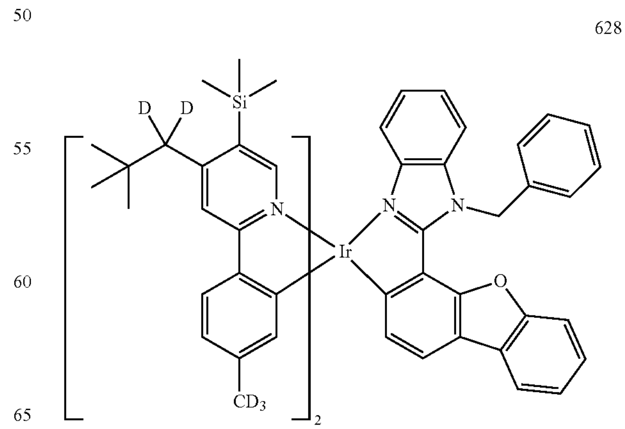

-continued
629
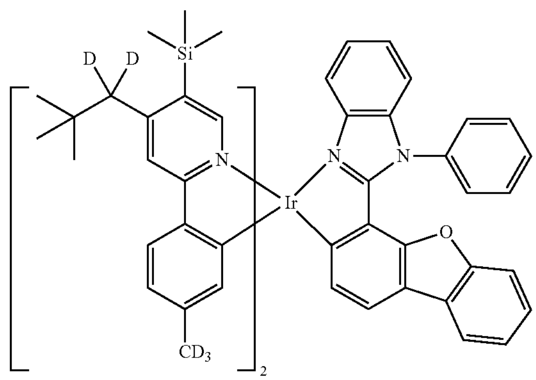
630
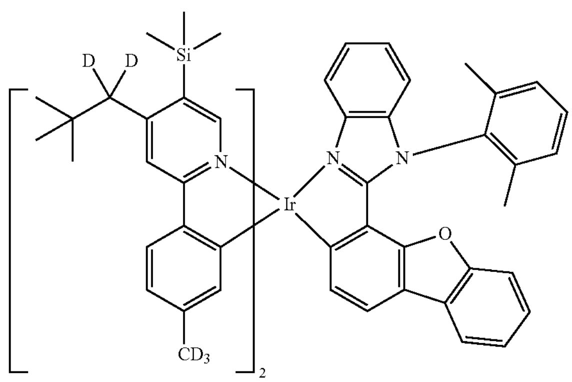
631
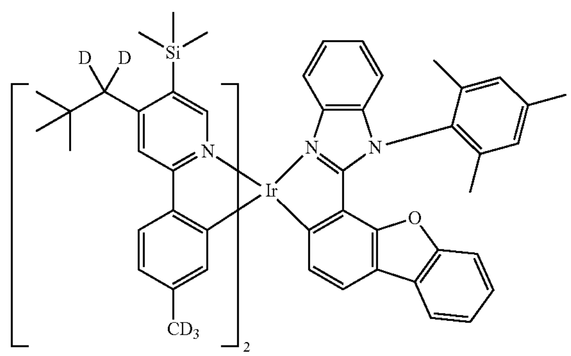
632
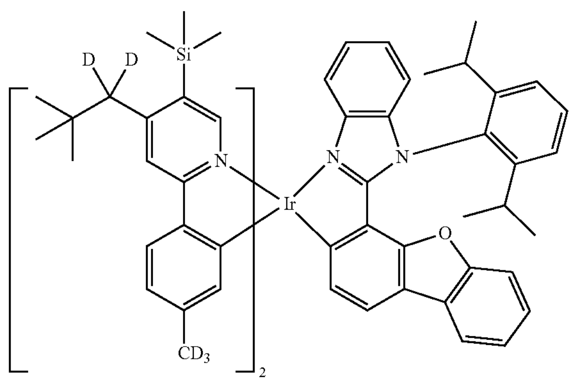
-continued
633
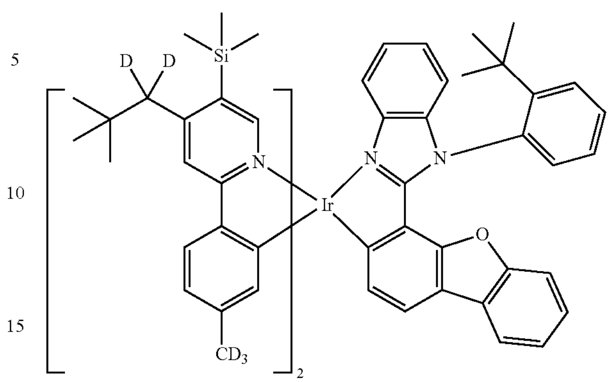
634
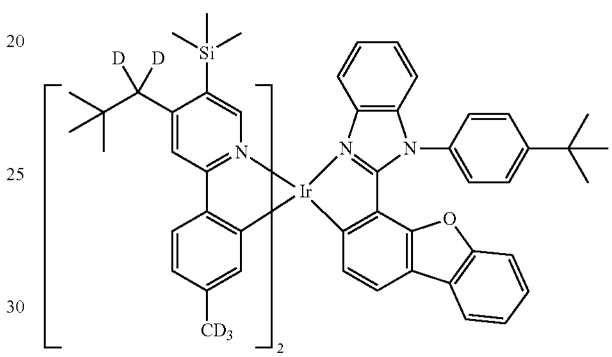
635
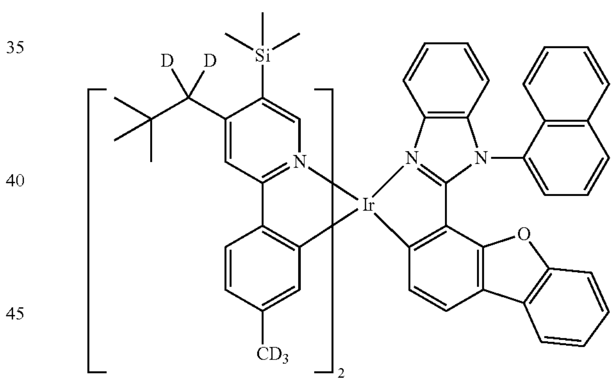
636
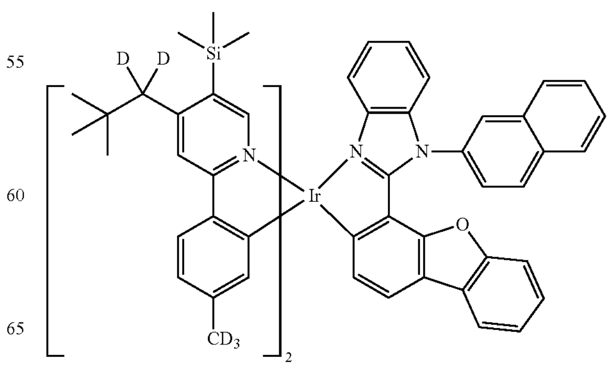

-continued
637
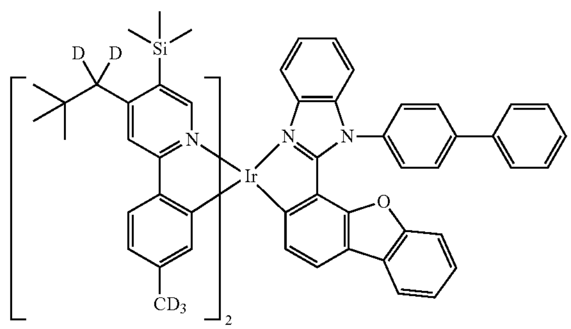
638
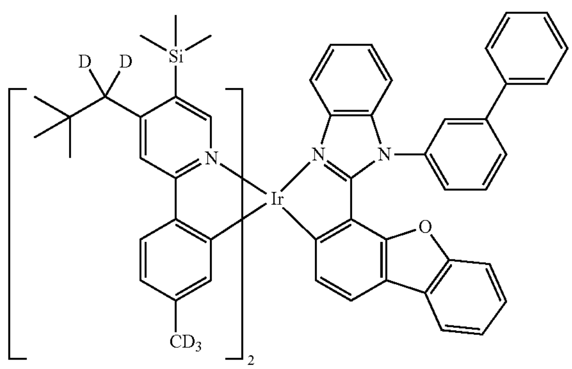
639
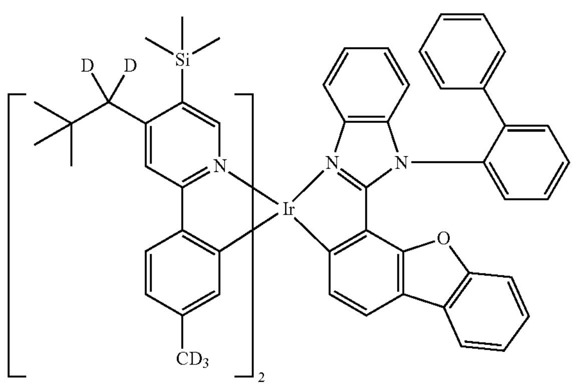
640
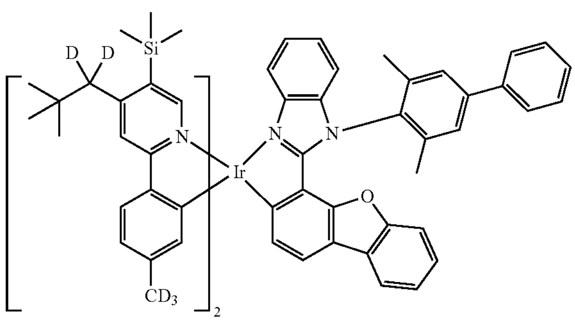
-continued
641
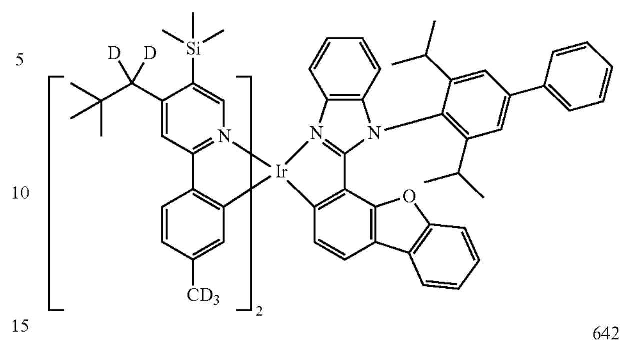
642
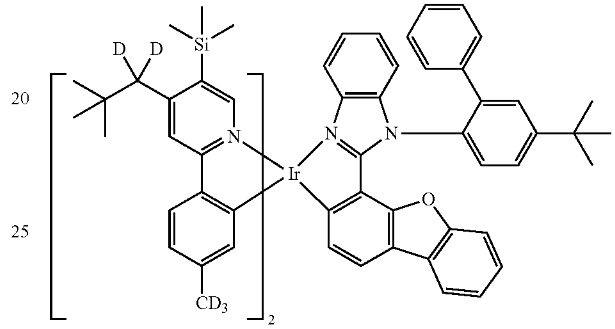
643
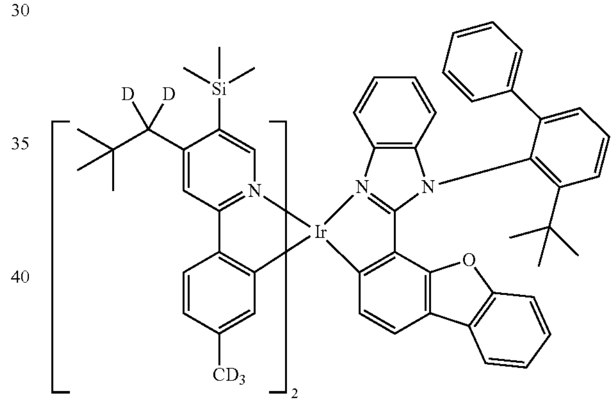
644
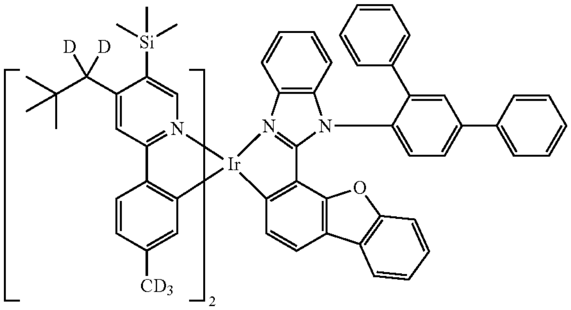

-continued
645
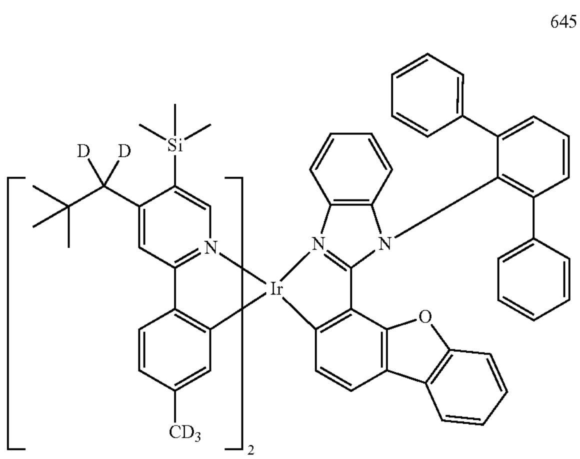
646
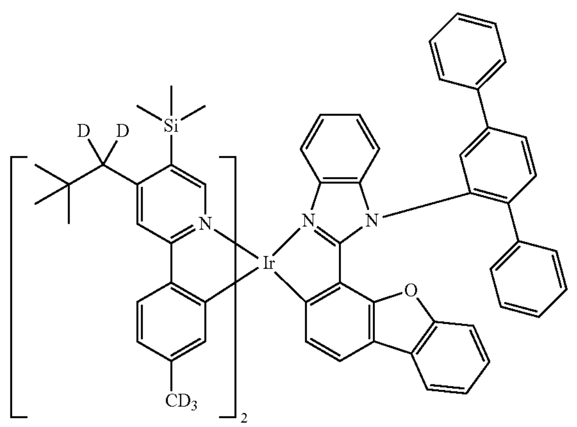
647
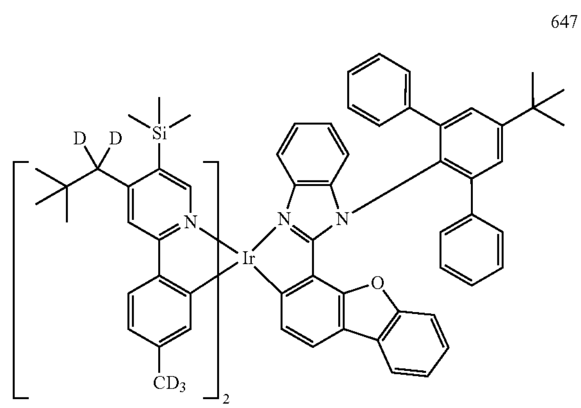
-continued
648
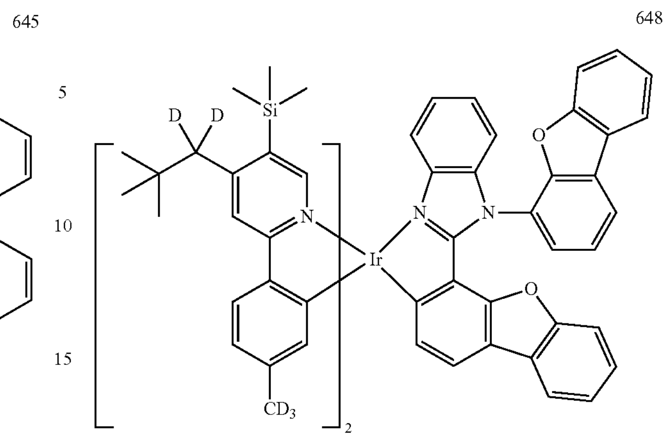
649
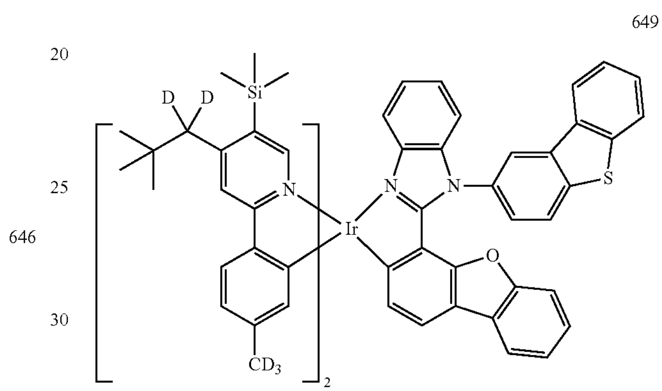
650
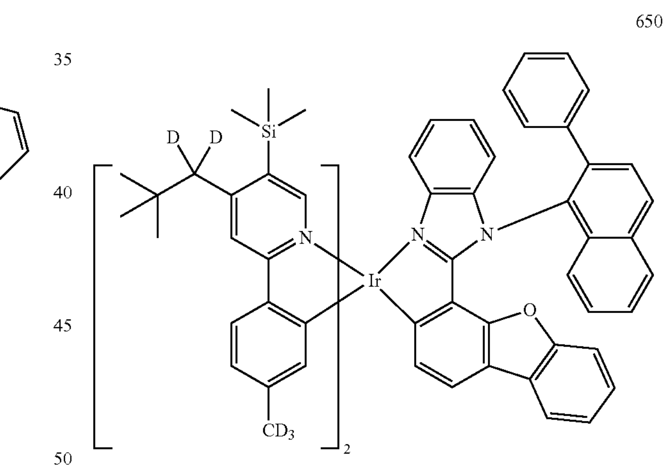
651
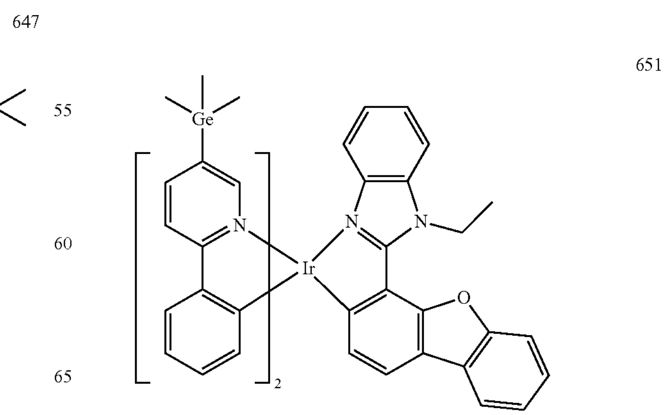

652
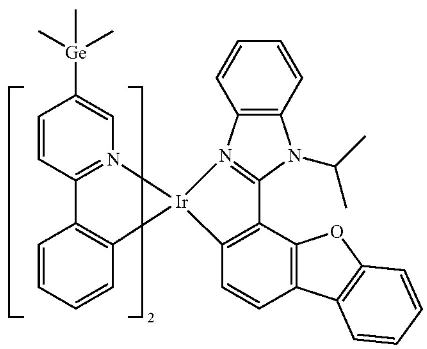
653
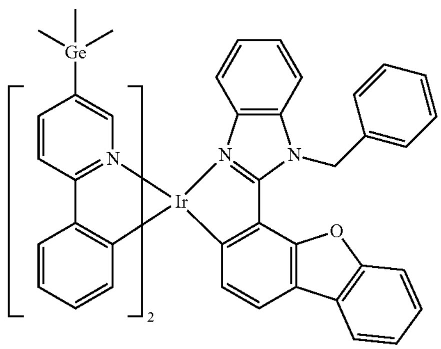
654
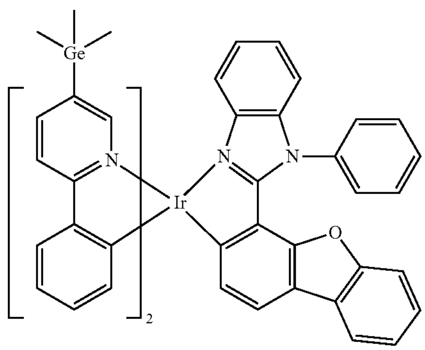
655
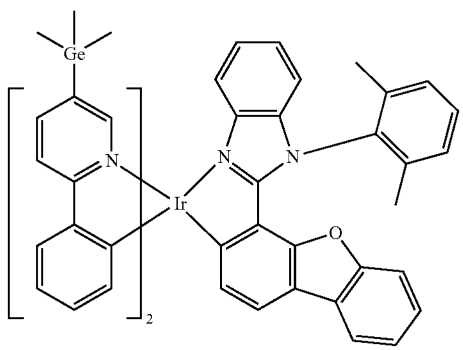
656
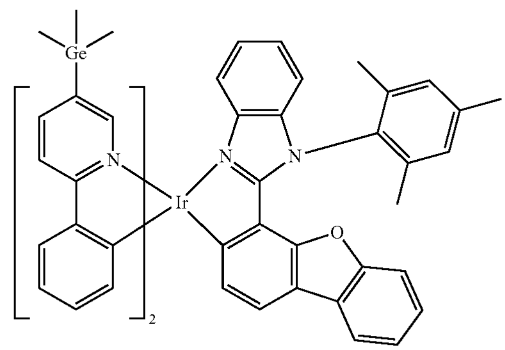
657
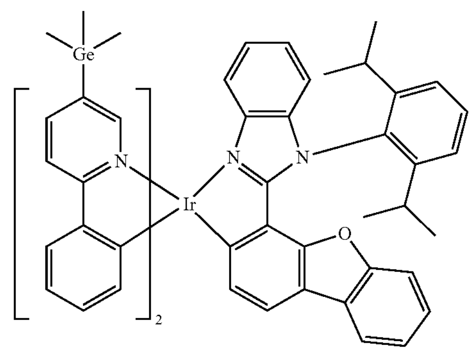
658
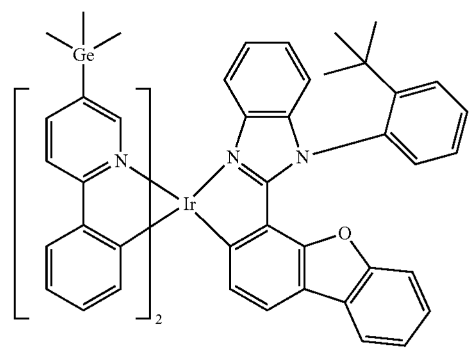
659
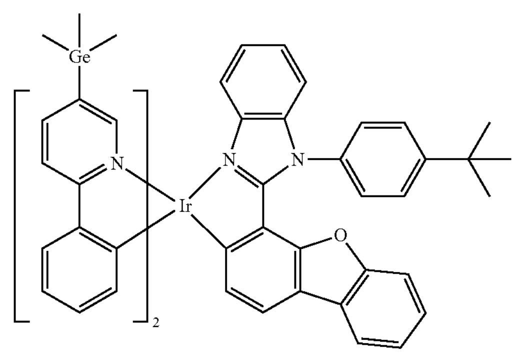

-continued
660
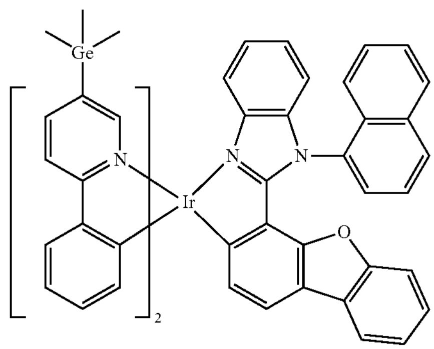
661
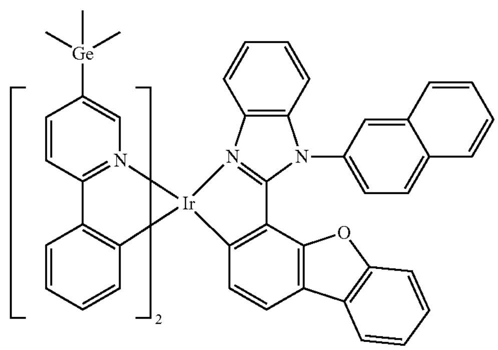
662
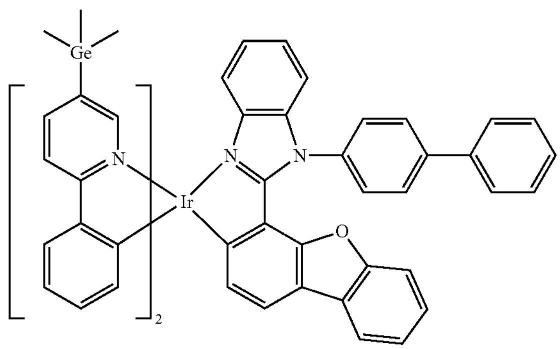
663
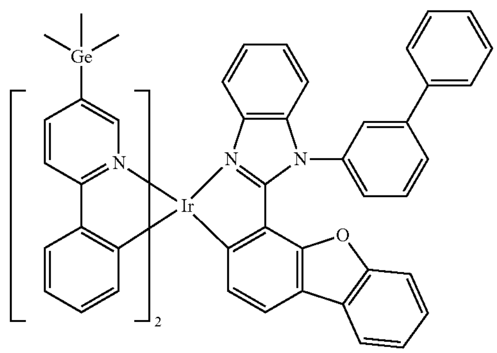
-continued
664
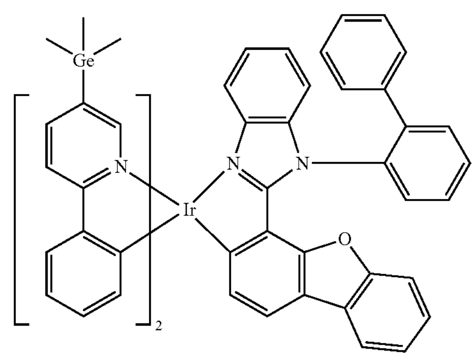
665
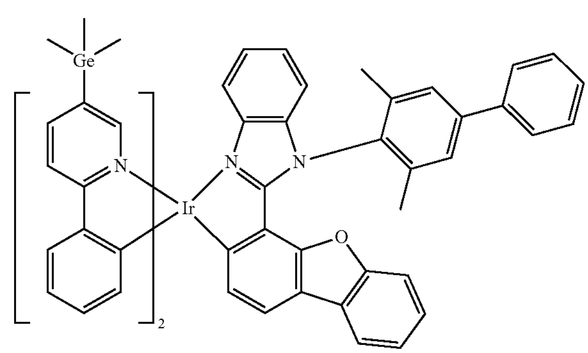
666
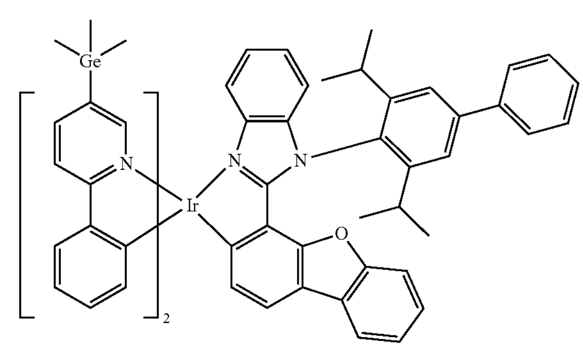
667
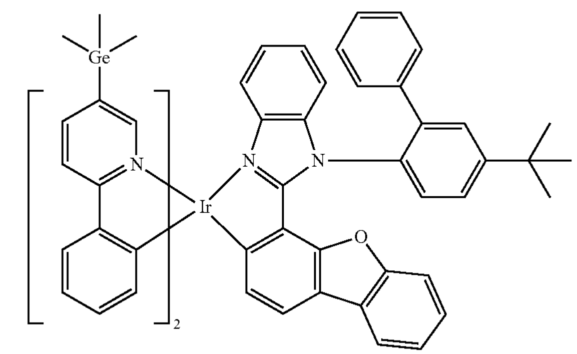

-continued
668
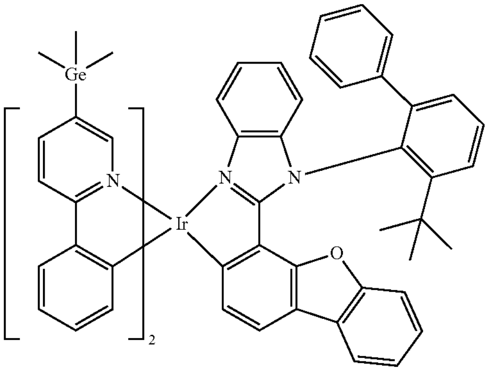
669
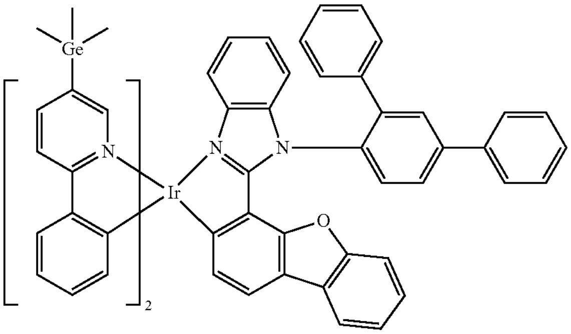
670
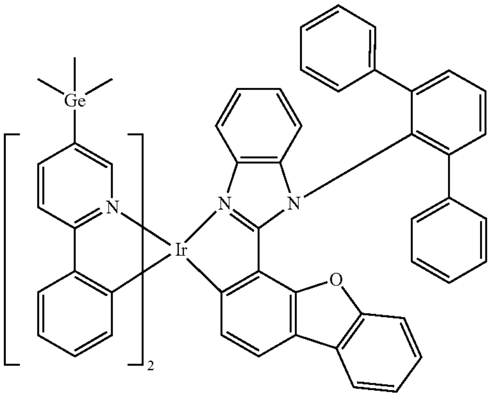
671
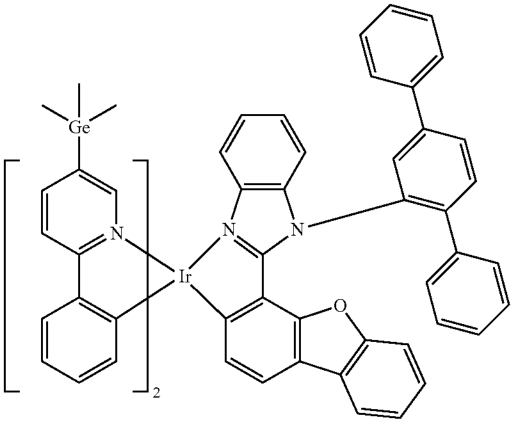
-continued
672
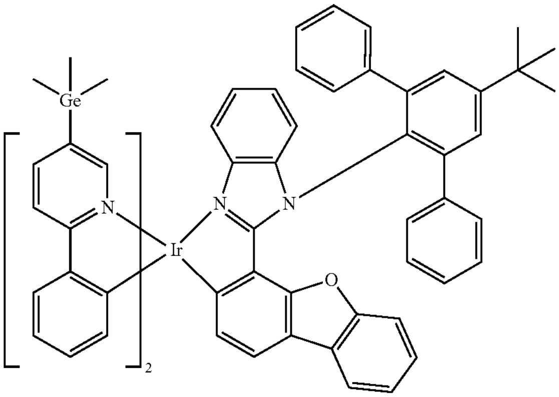
673
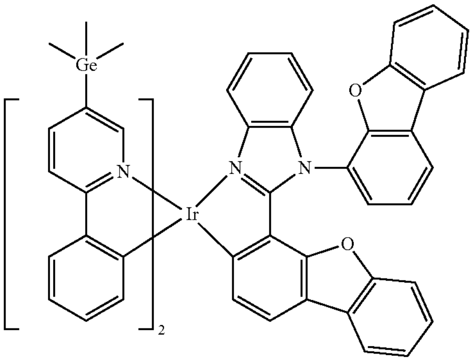
674
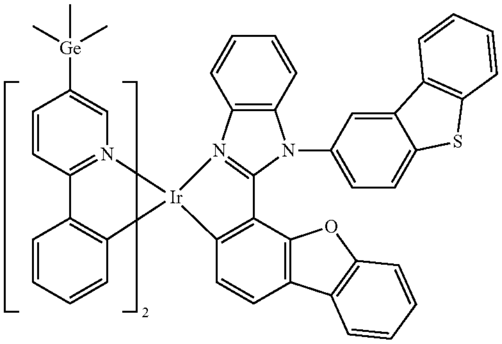
675
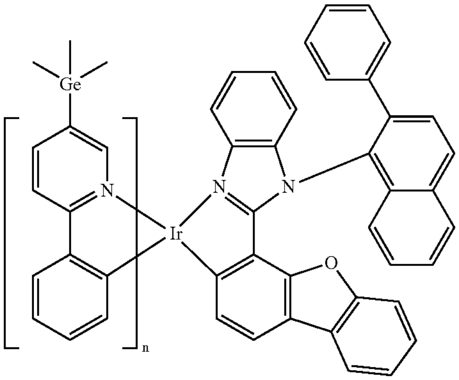

-continued
676
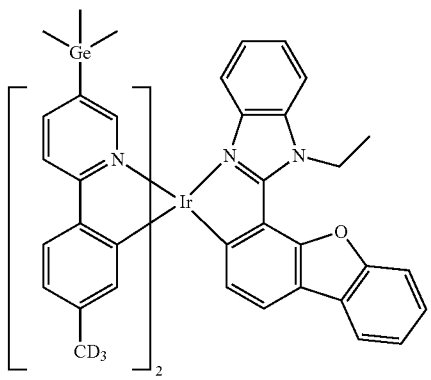
677
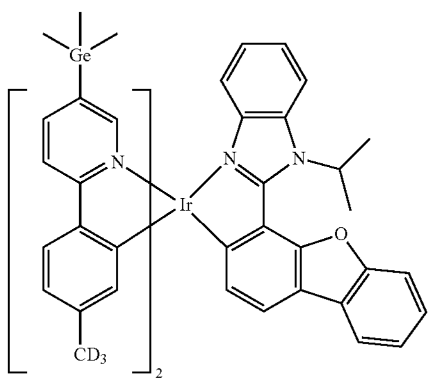
678
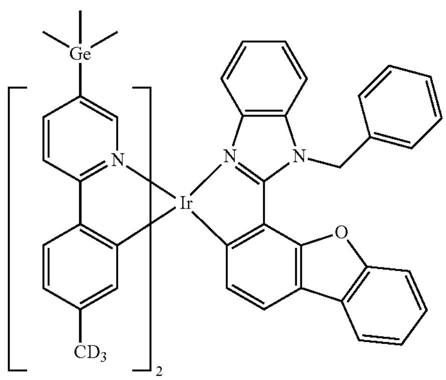
679
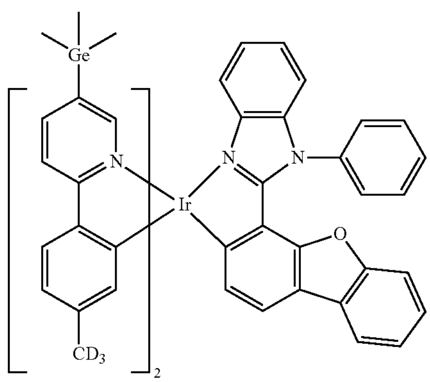
-continued
680
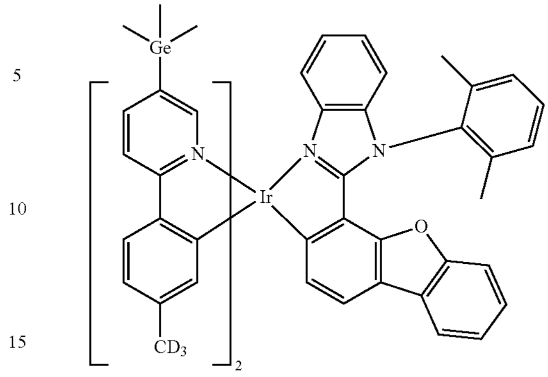
681
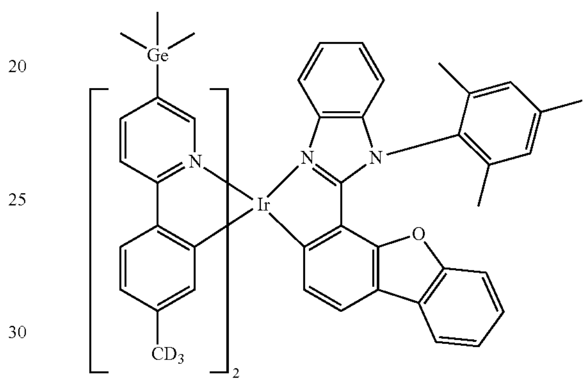
682
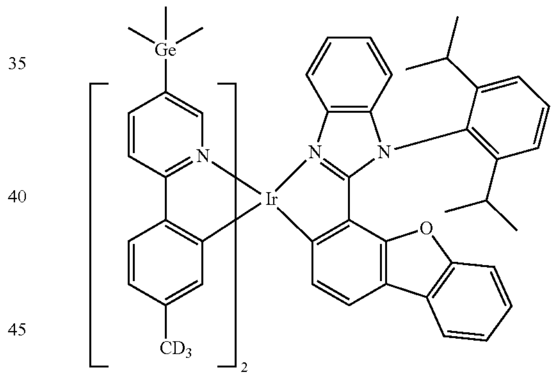
683
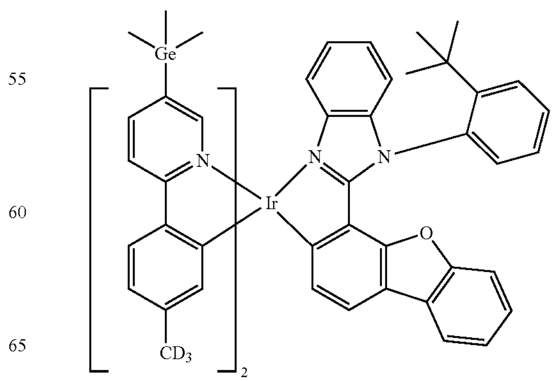

-continued
684
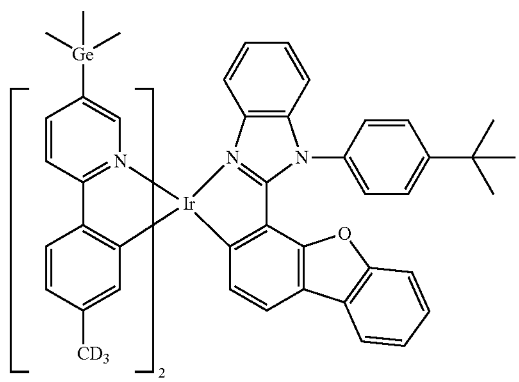
685
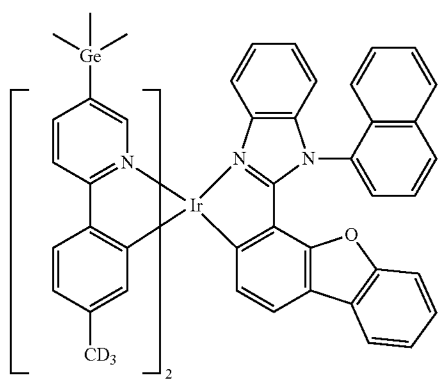
686
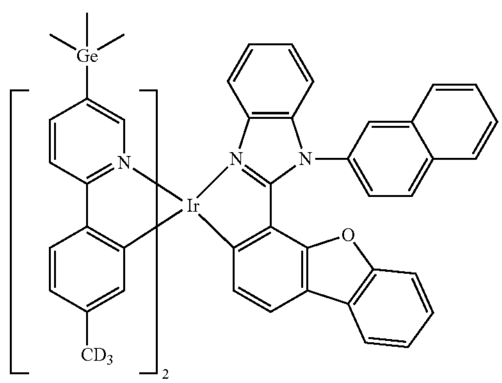
687
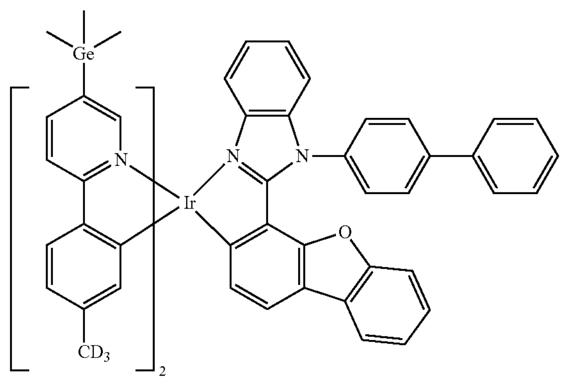
-continued
688
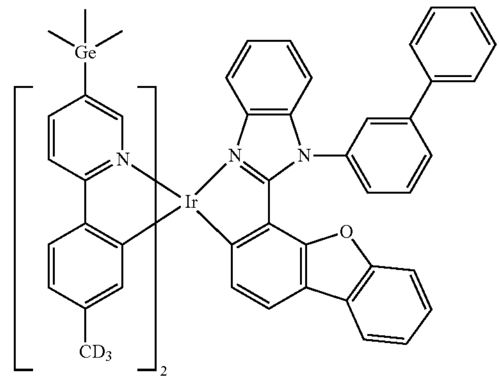
689
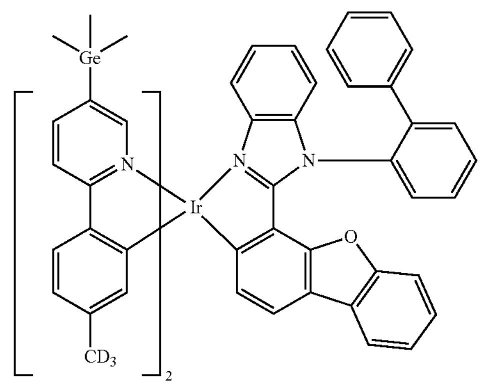
690
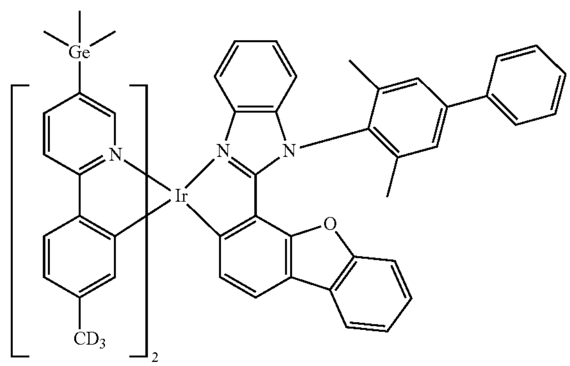
691
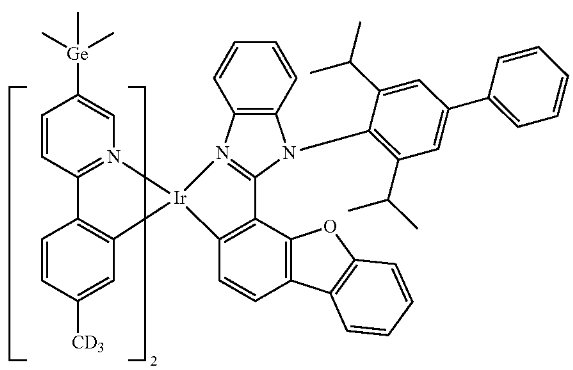

-continued
692
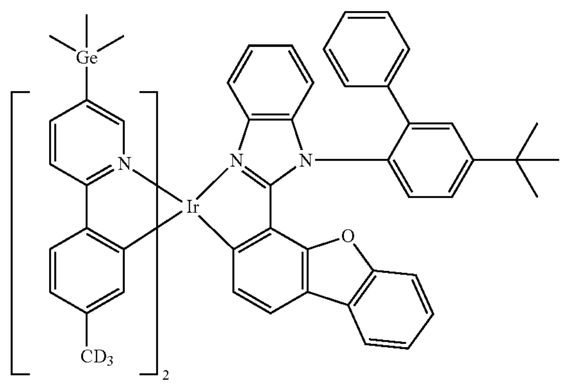
693
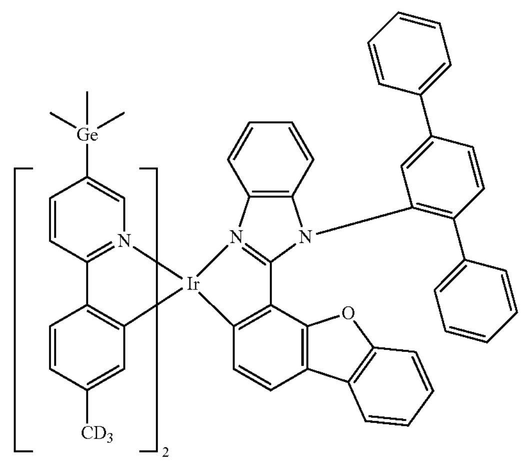
694
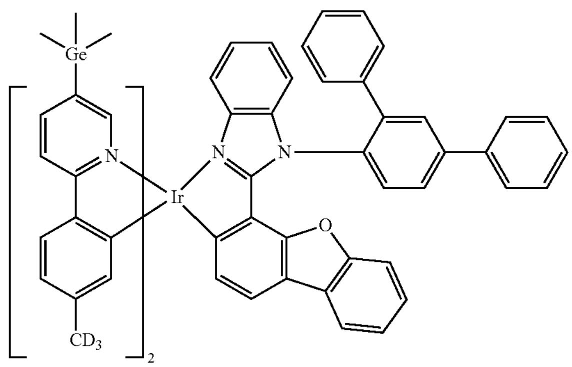
-continued
695
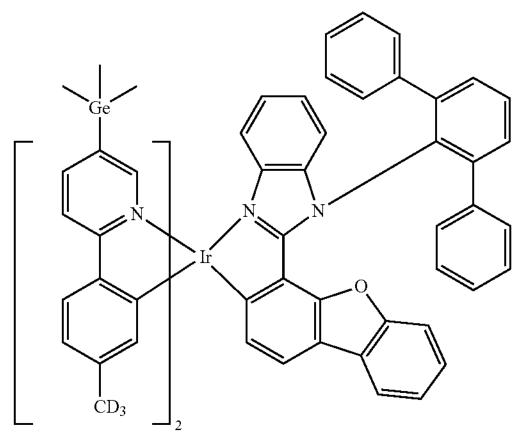
696
697
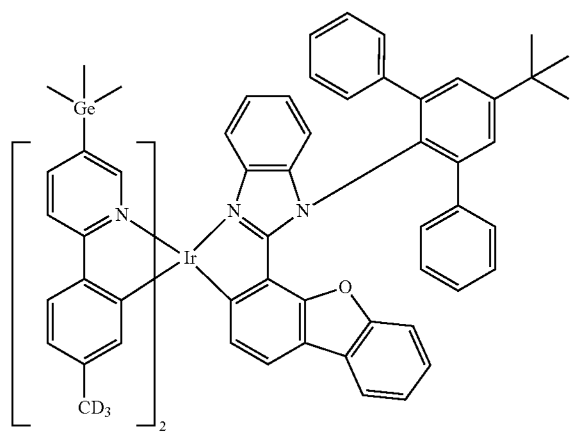

-continued
698
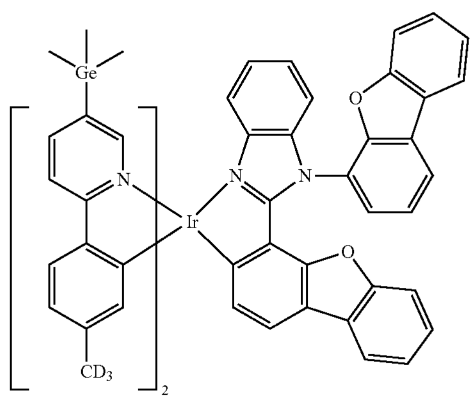
699
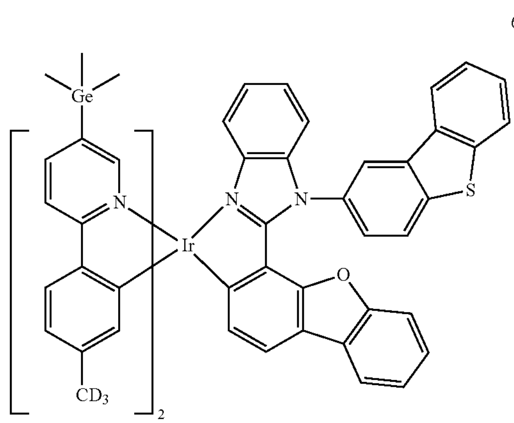
700
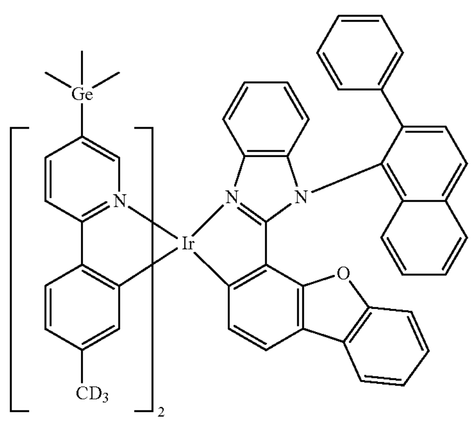
701
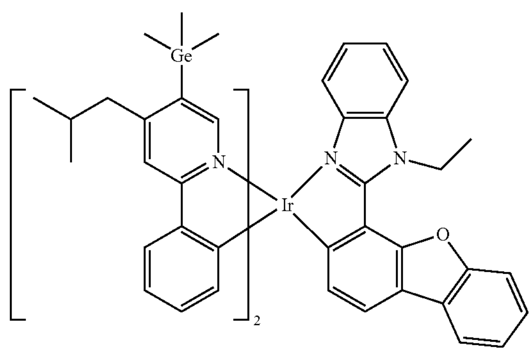
-continued
702
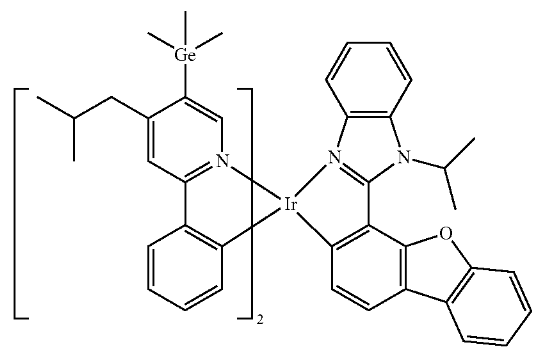
703
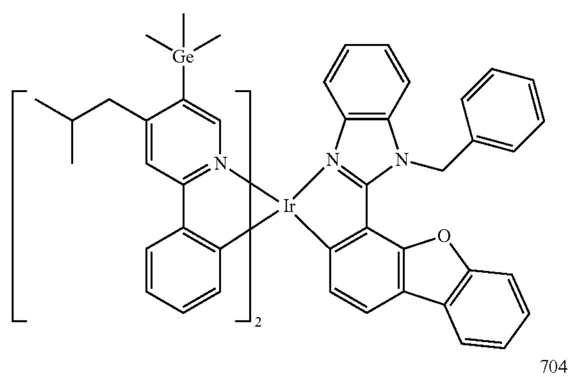
704
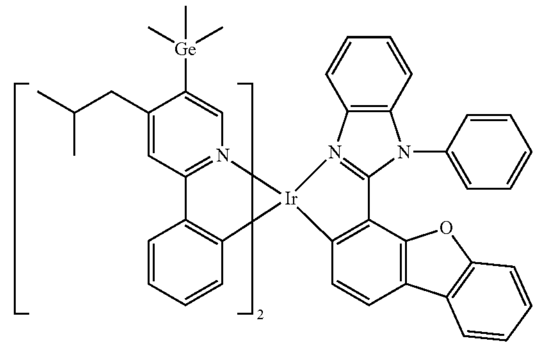
705
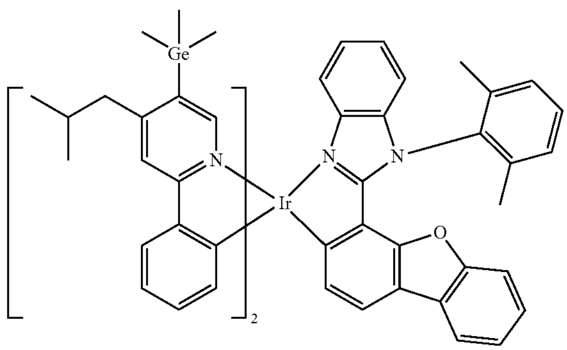

-continued
706
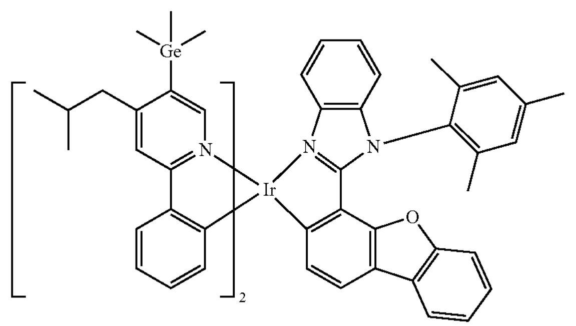
707
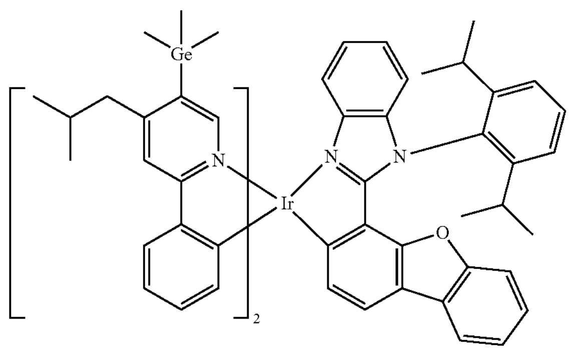
708
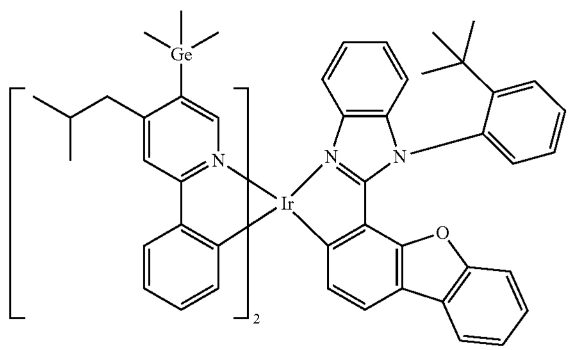
709
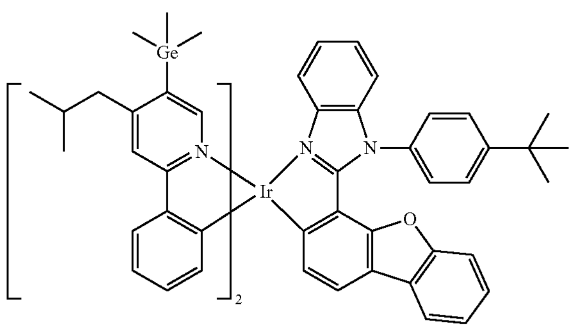
-continued
710
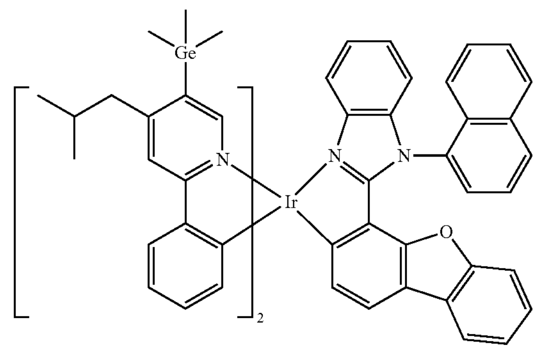
711
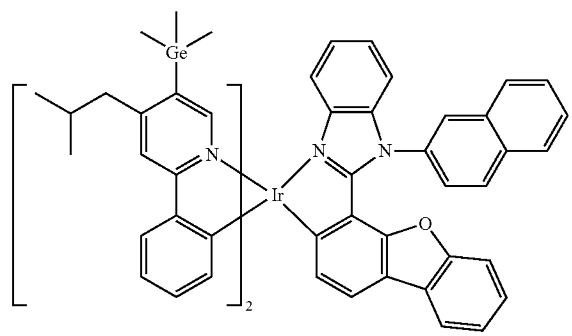
712
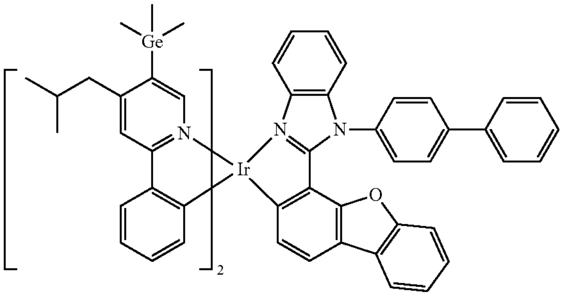
713
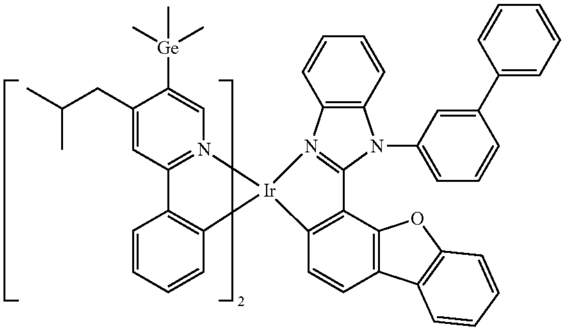

714
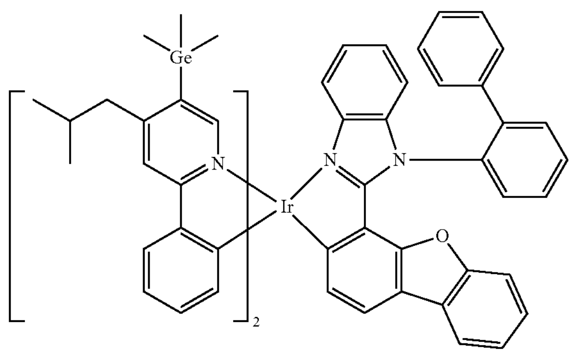
715
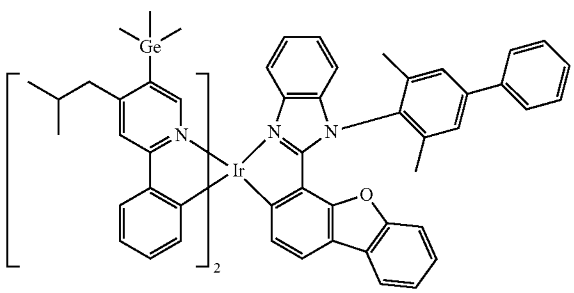
716
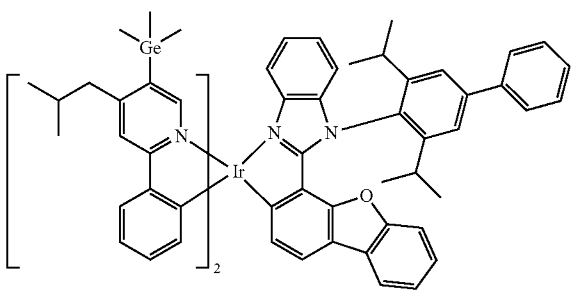
717
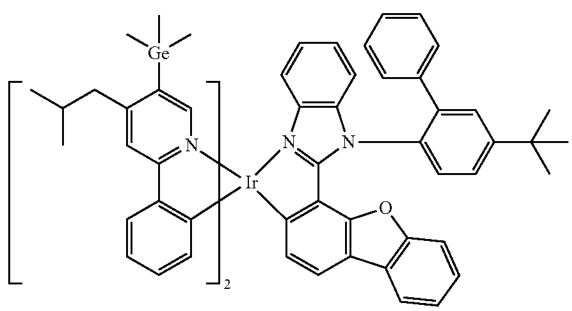
718
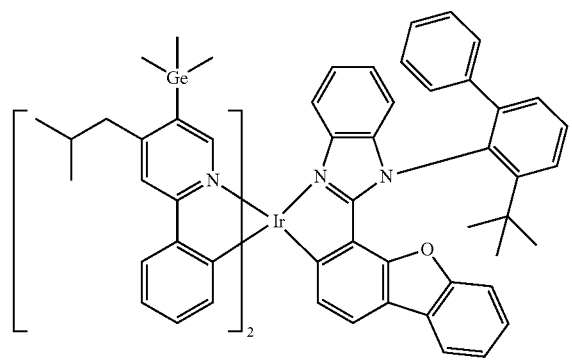
719
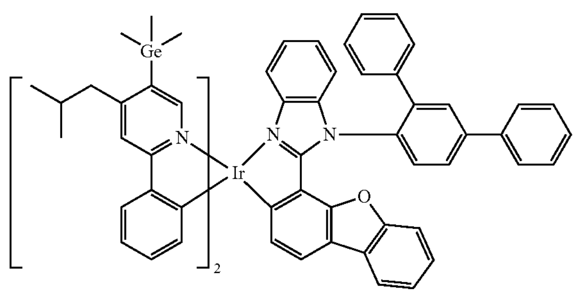
720
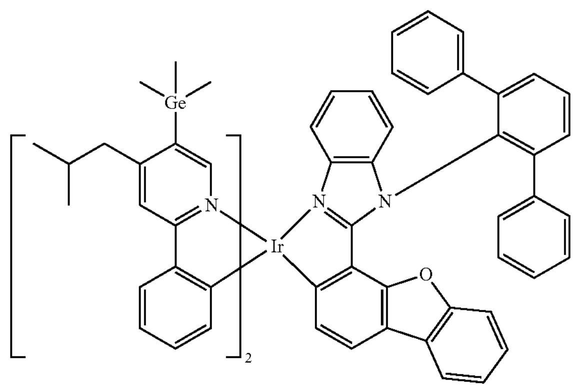
721
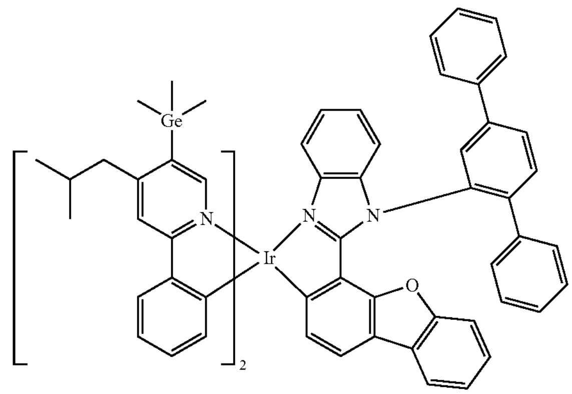

-continued
722
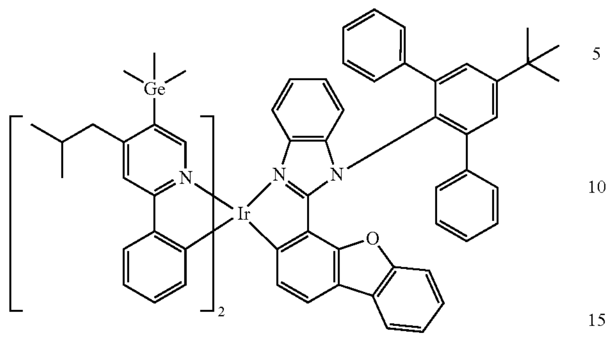
723
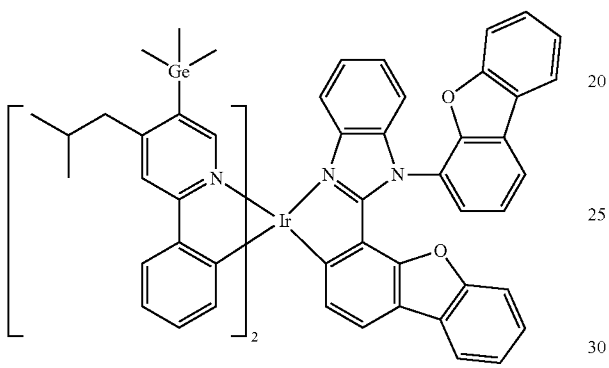
724
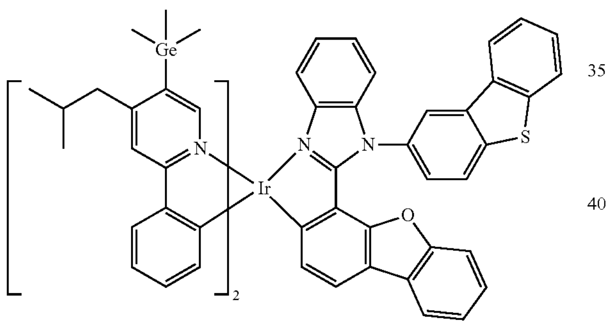
725
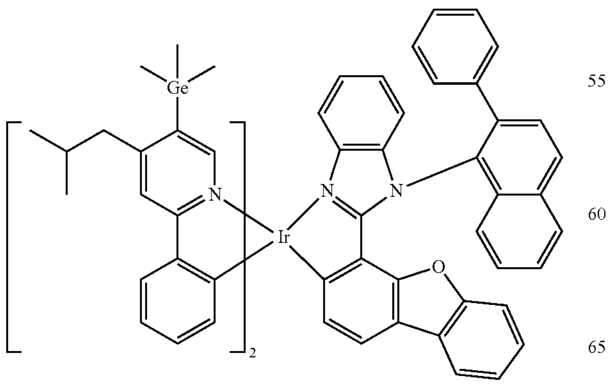
-continued
726
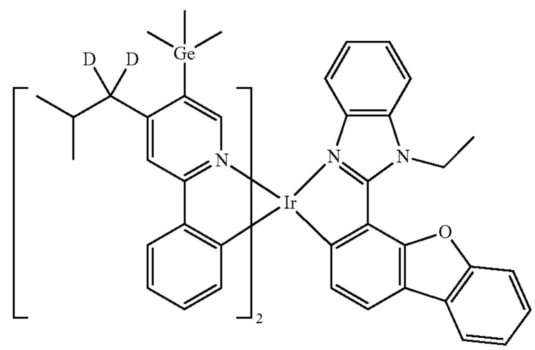
727
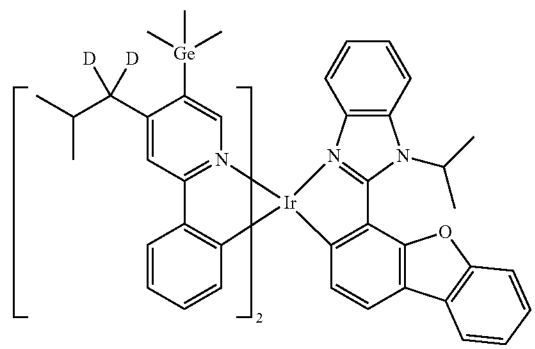
728
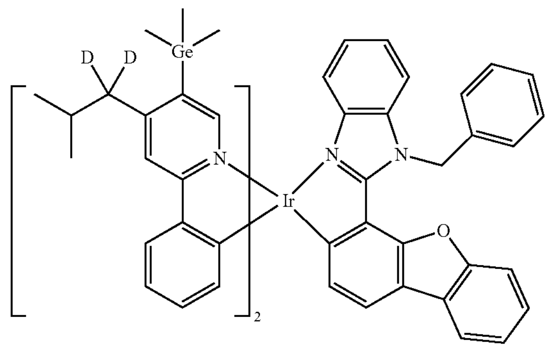
729
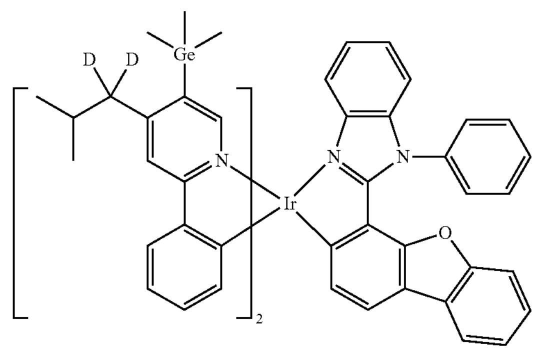

-continued
730
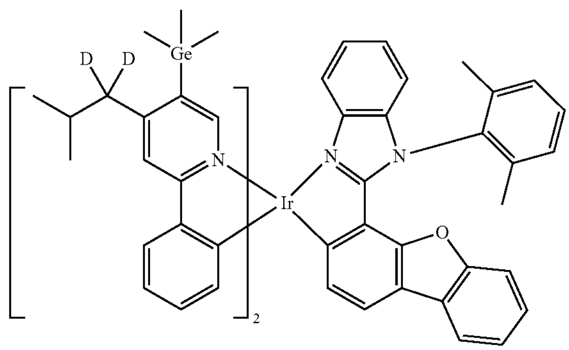
731
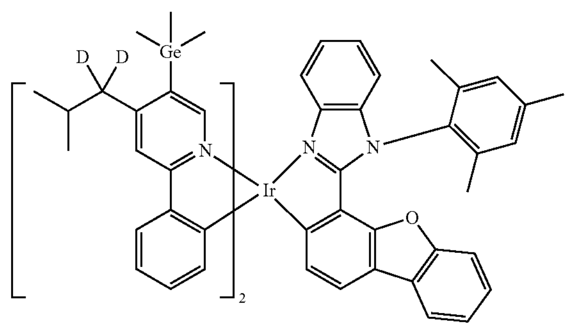
732
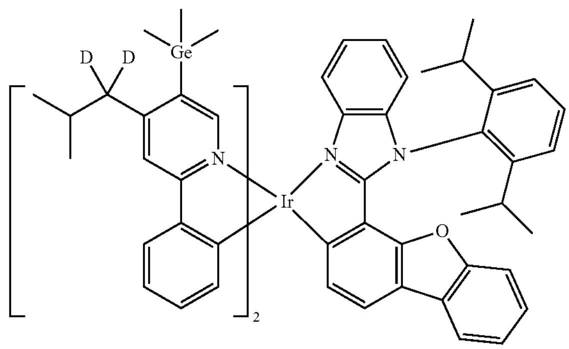
733
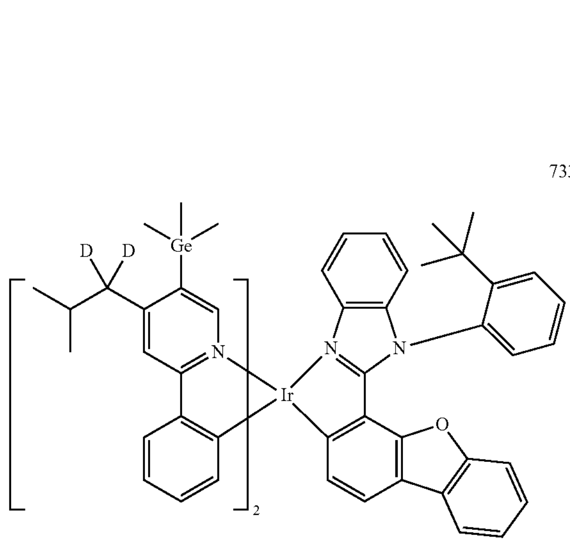
-continued
734
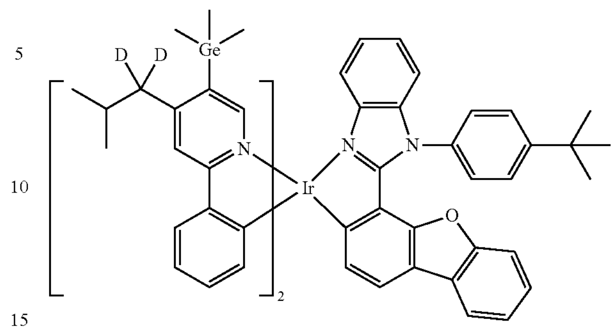
735
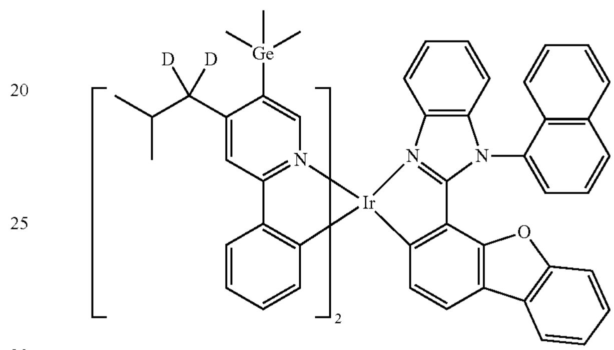
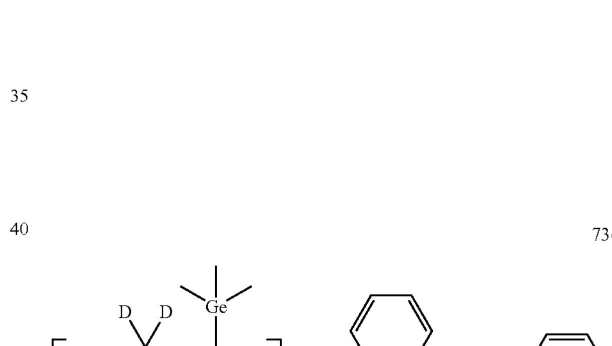
736
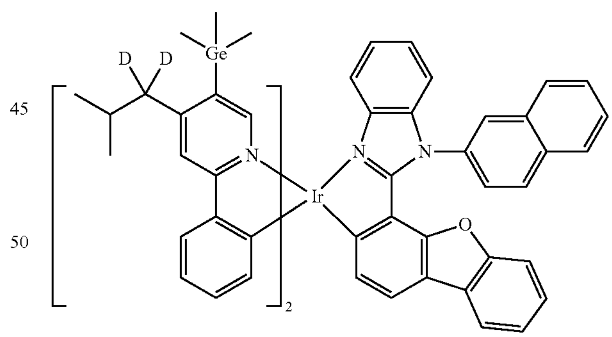
737
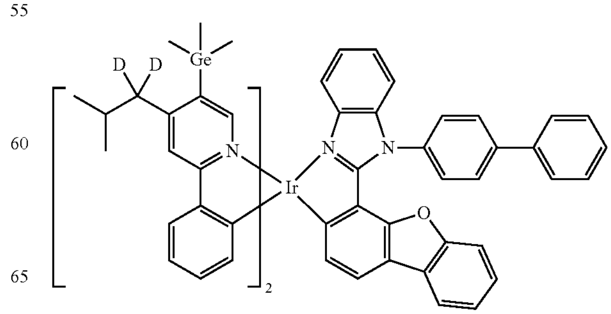

-continued
738
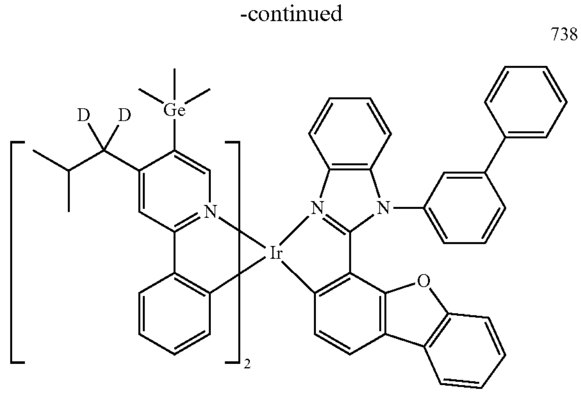
739
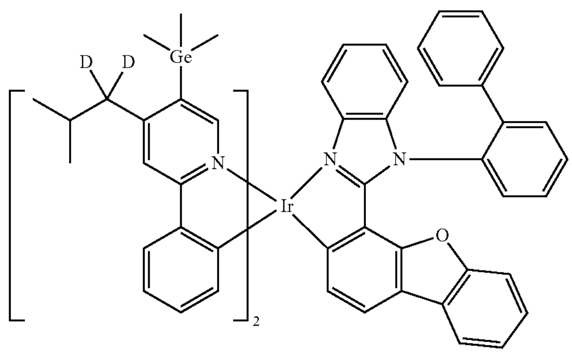
740
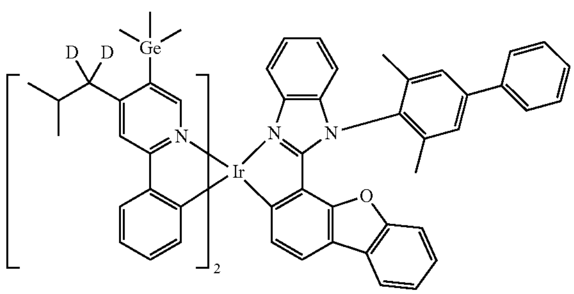
741
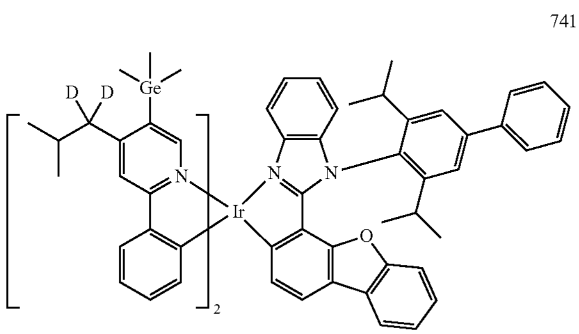
-continued
742
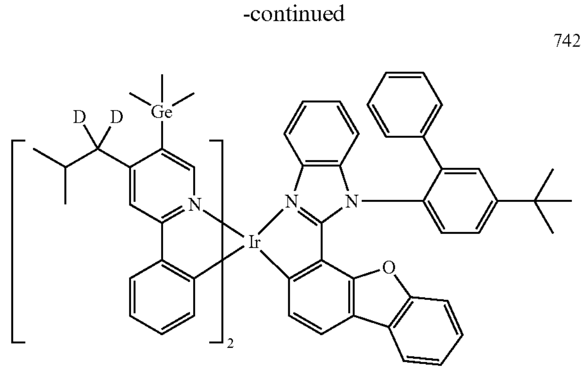
743
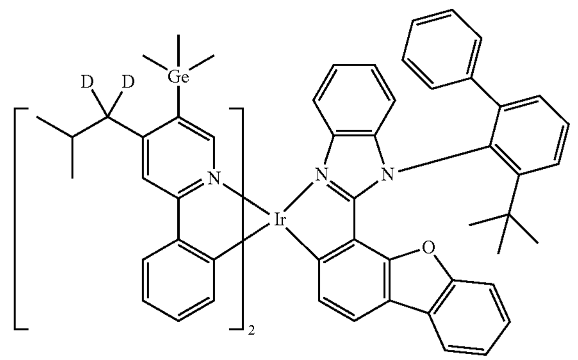
744
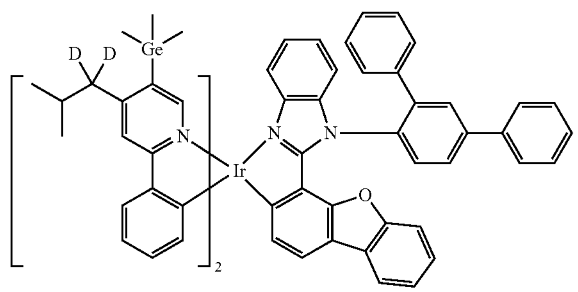
745
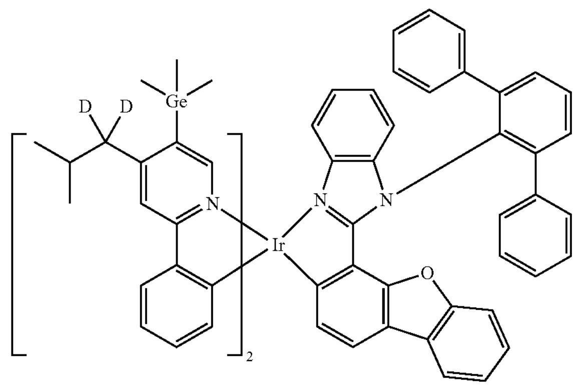

-continued
746
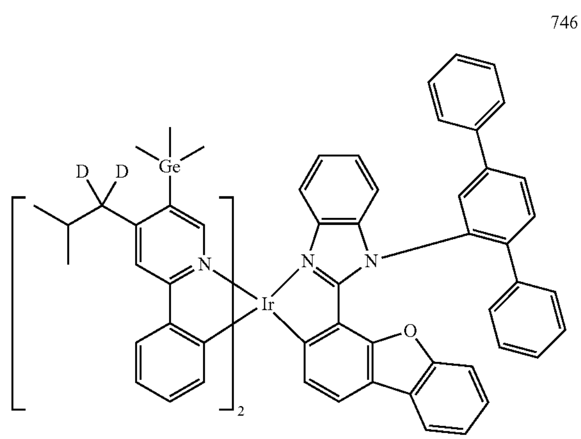
747
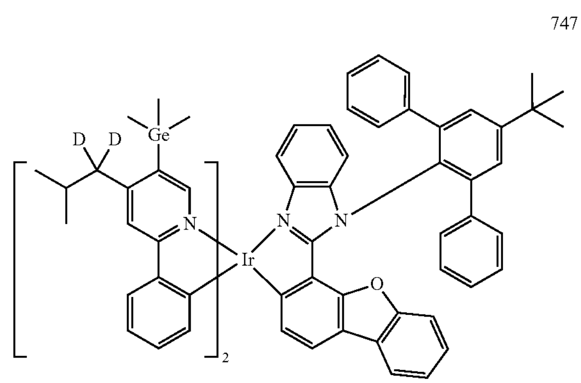
748
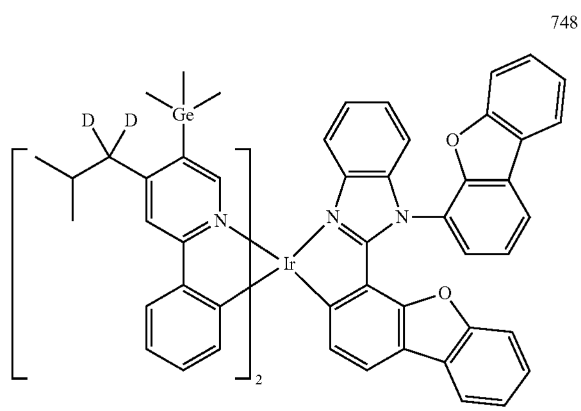
749
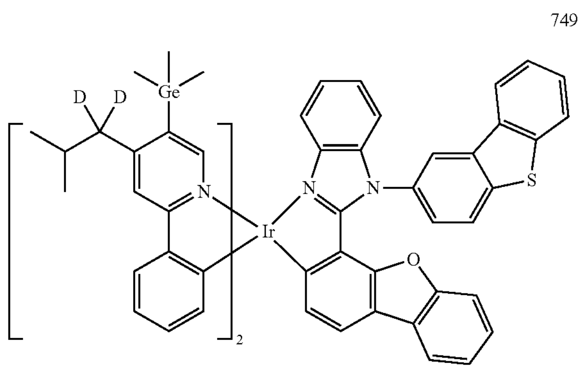
-continued
750
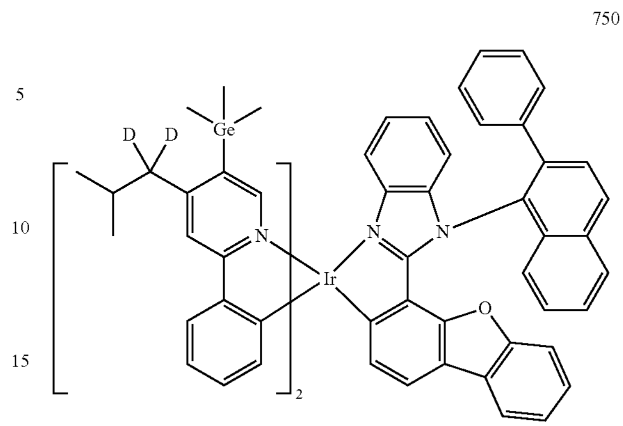
751
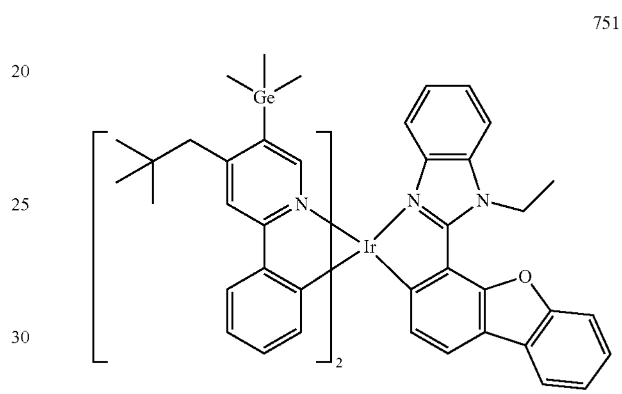
752
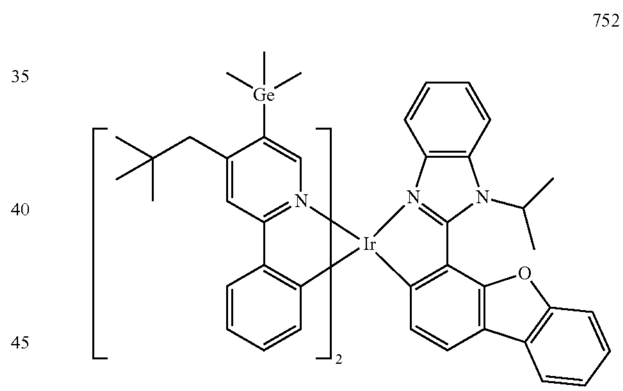
753
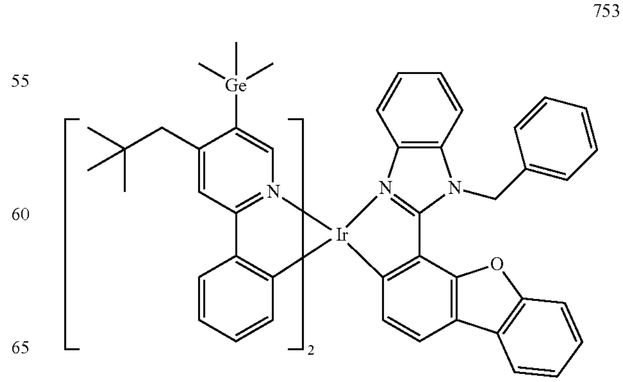

-continued
754
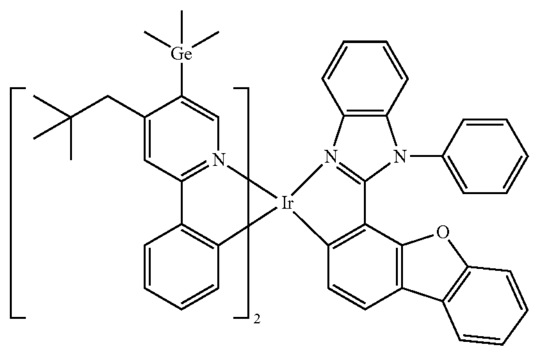
755
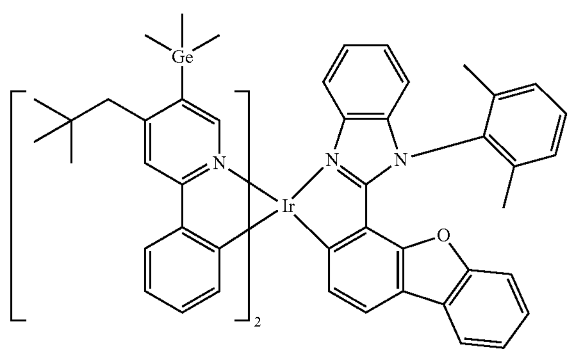
756
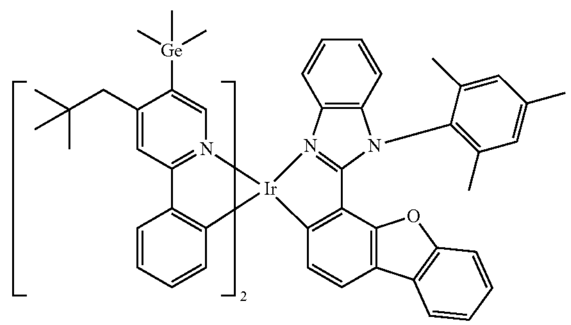
757
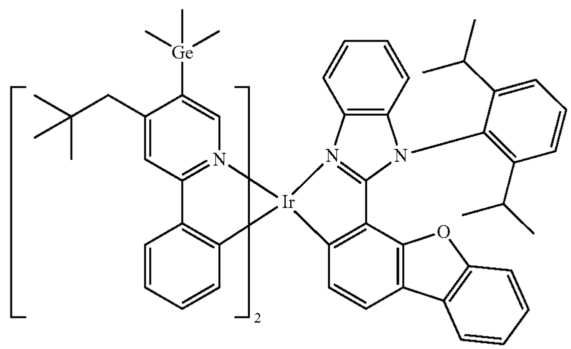
-continued
758
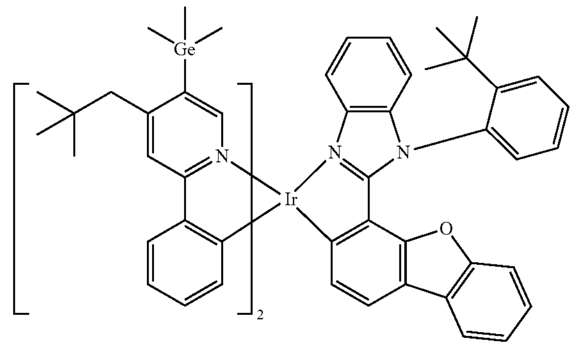
759
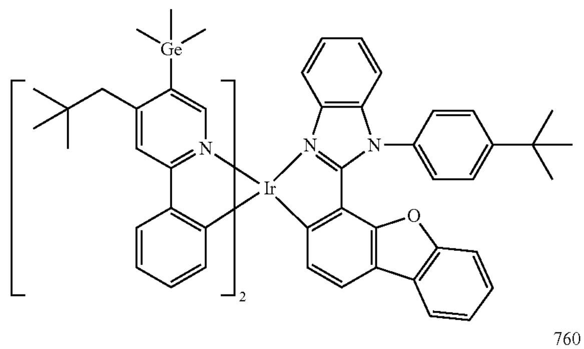
760
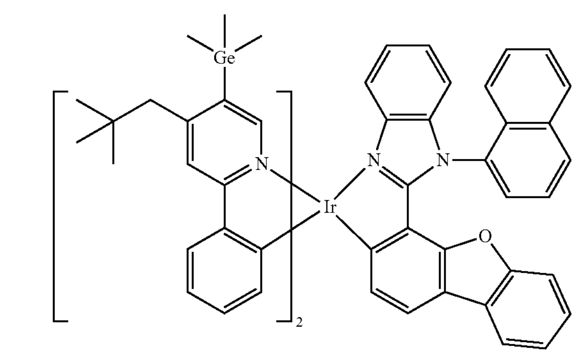
761
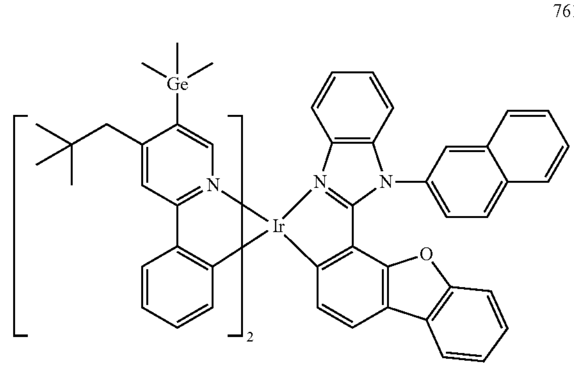

-continued
762
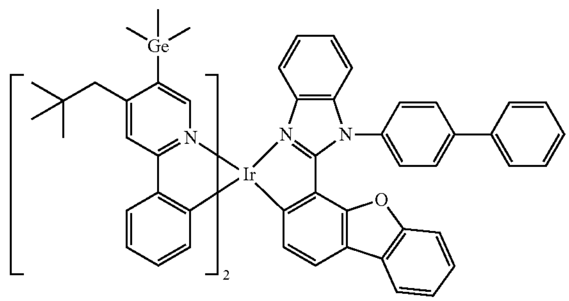
763
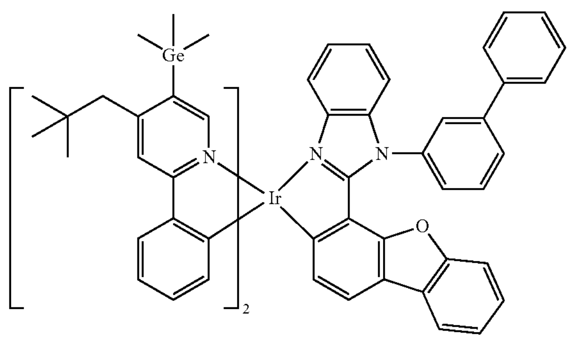
764
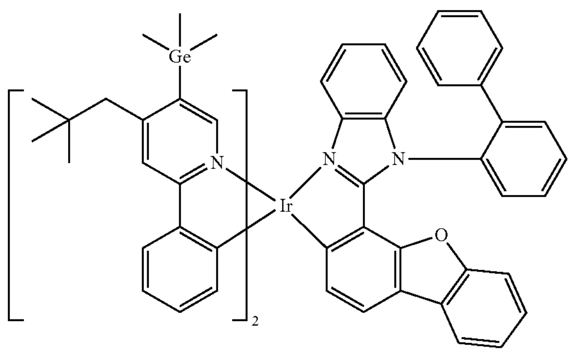
765
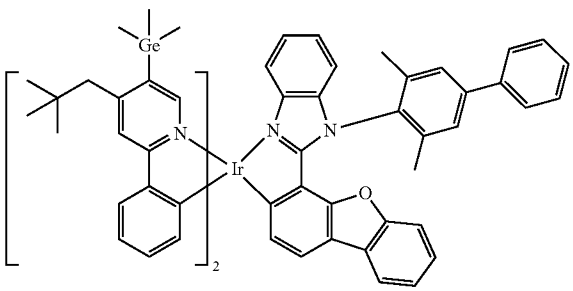
-continued
766
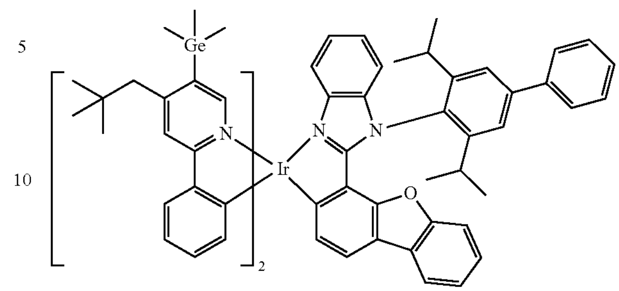
767
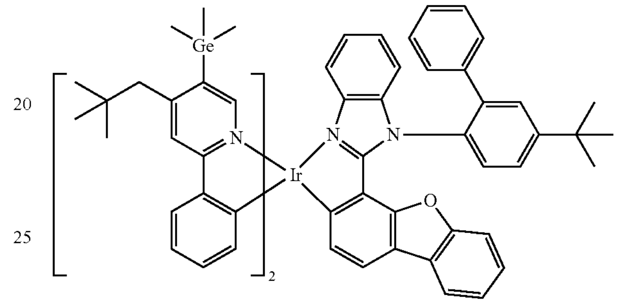
768
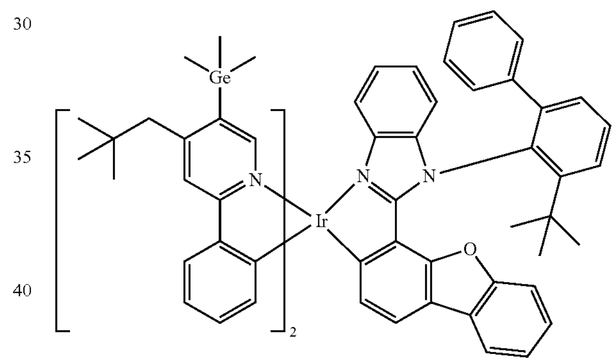
769
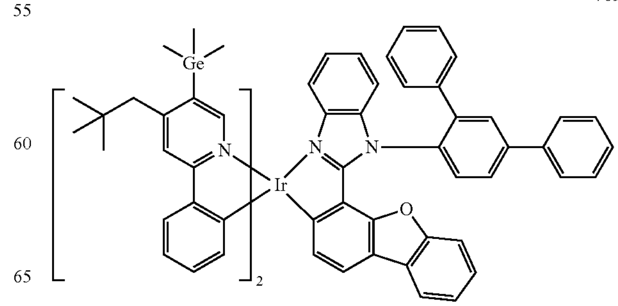

-continued
770
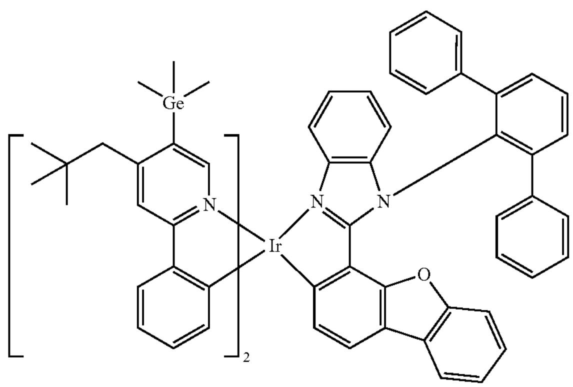
771
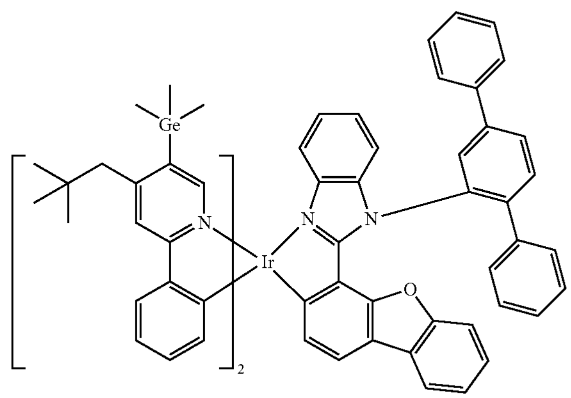
772
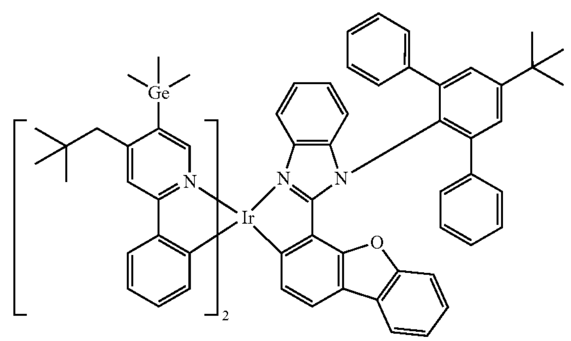
773
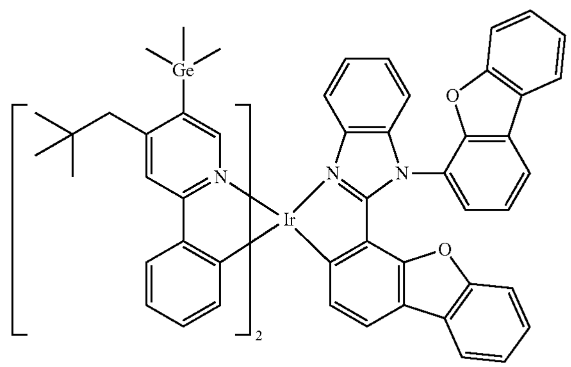
-continued
774
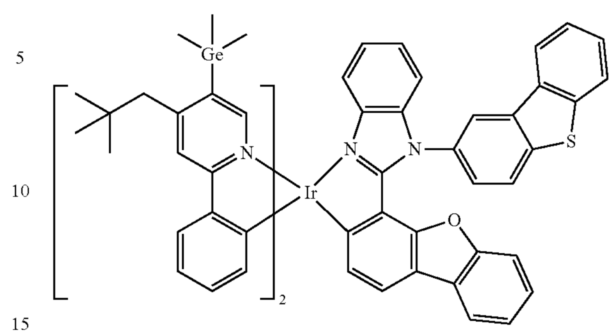
775
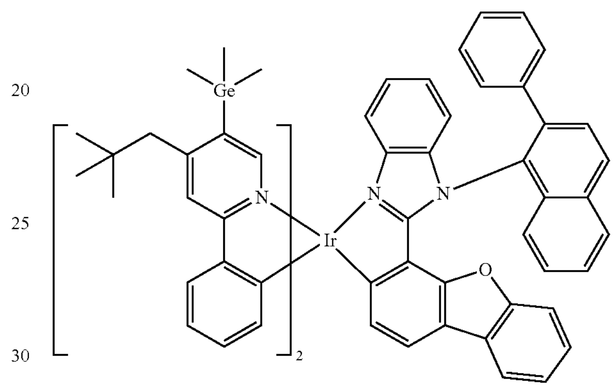
776
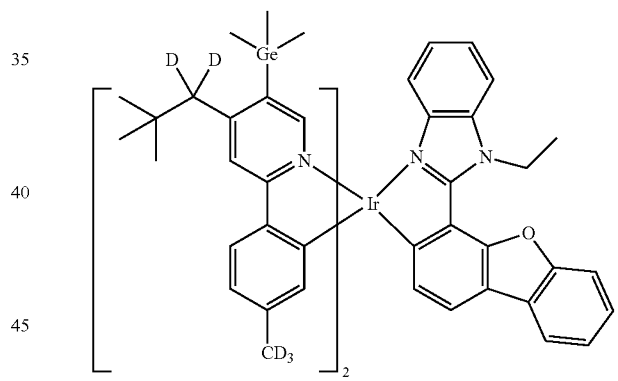
777
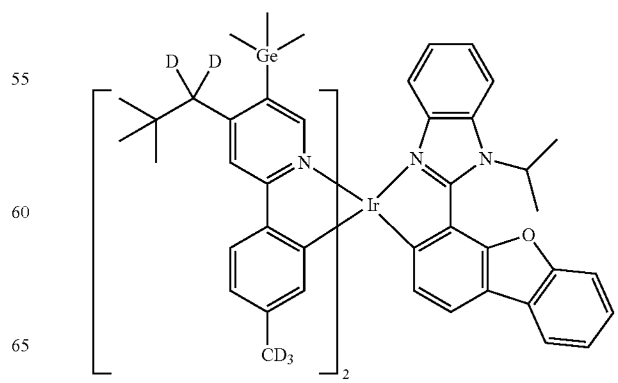

-continued
778
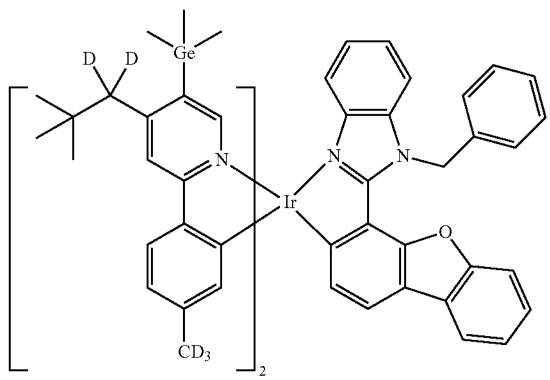
779
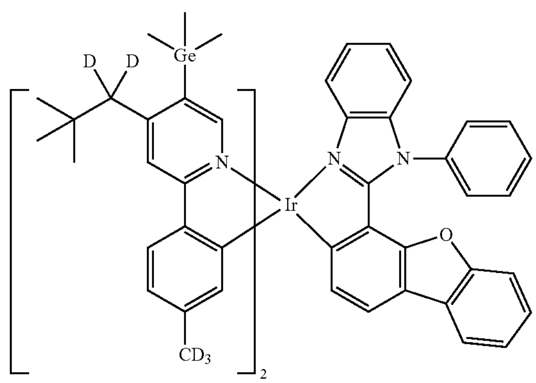
780
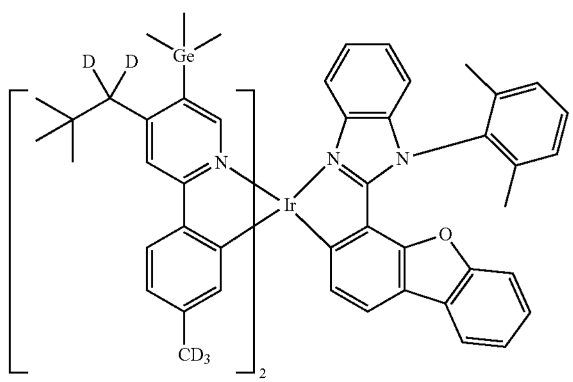
781
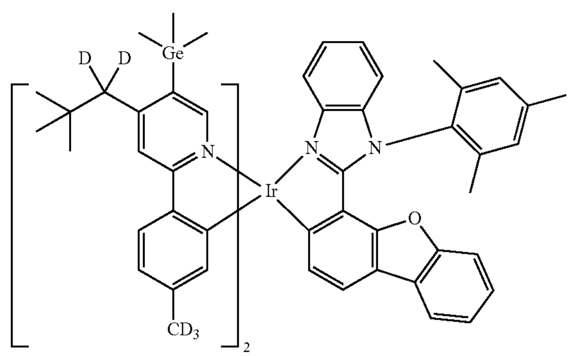
-continued
782
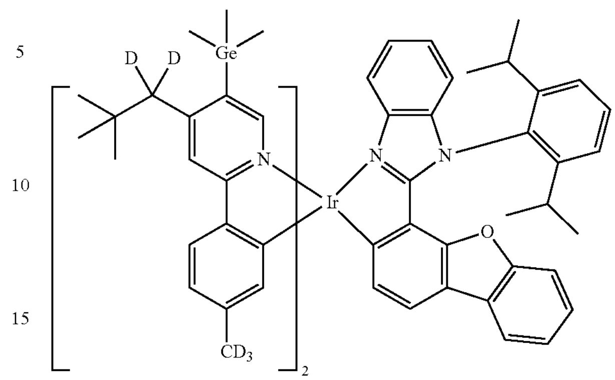
783
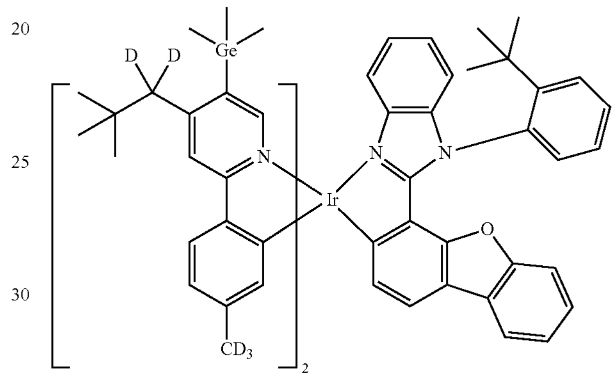
784
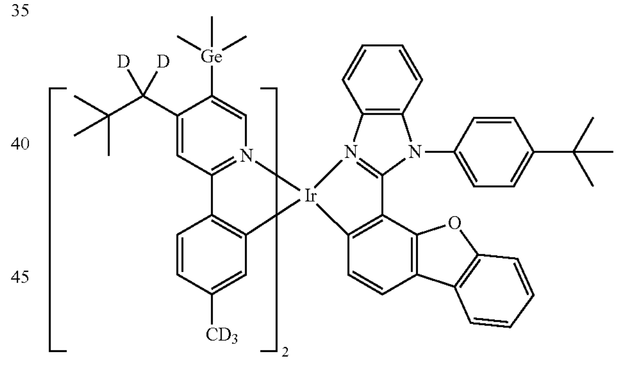
785
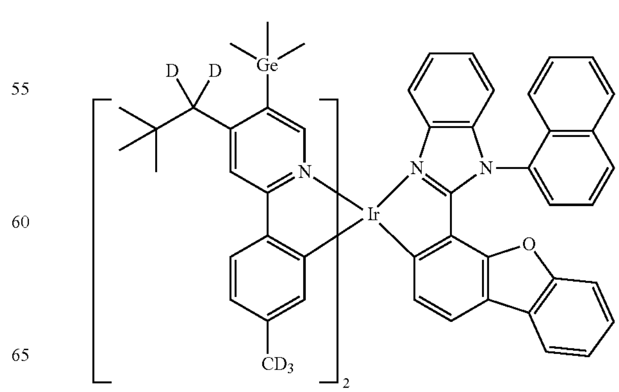

-continued
786
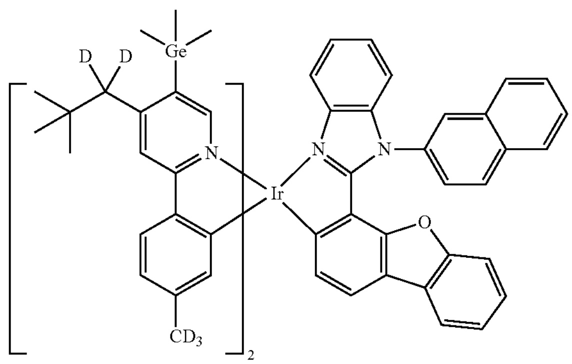
787
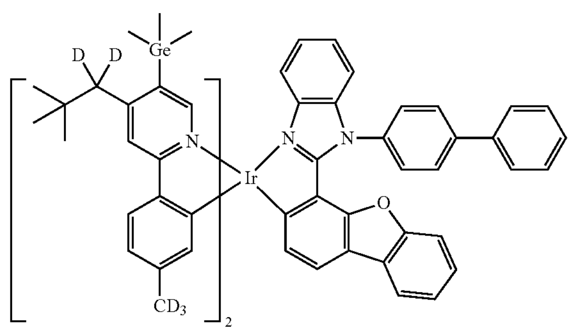
788
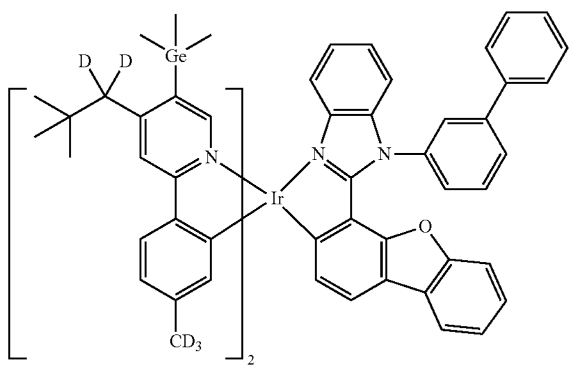
789
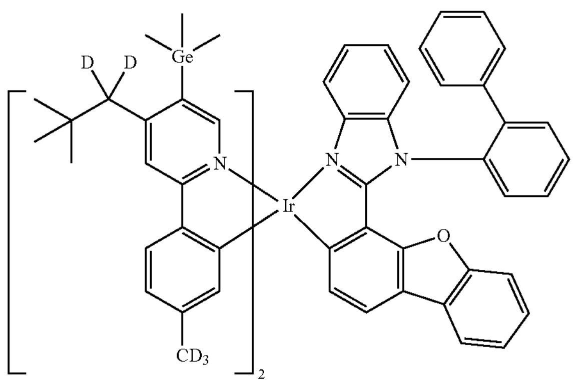
-continued
790
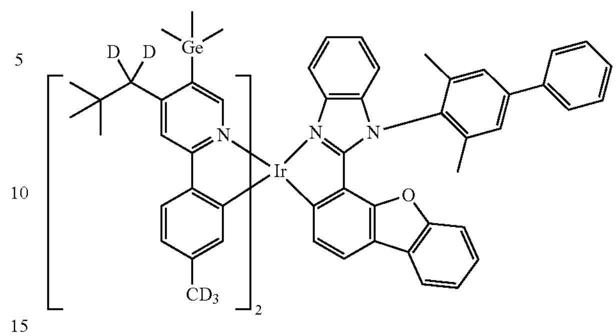
791
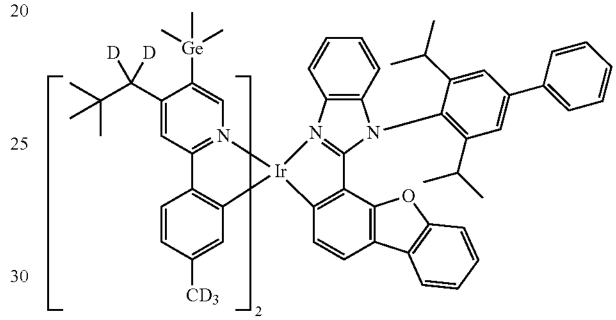
792
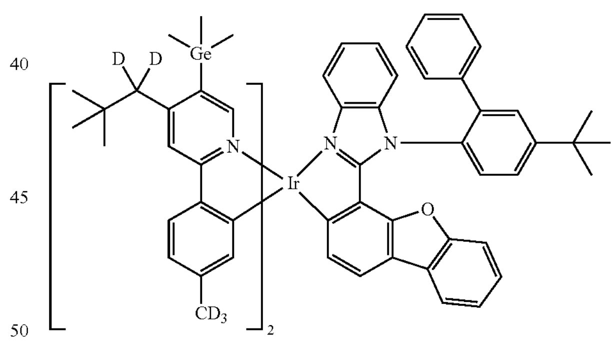
793
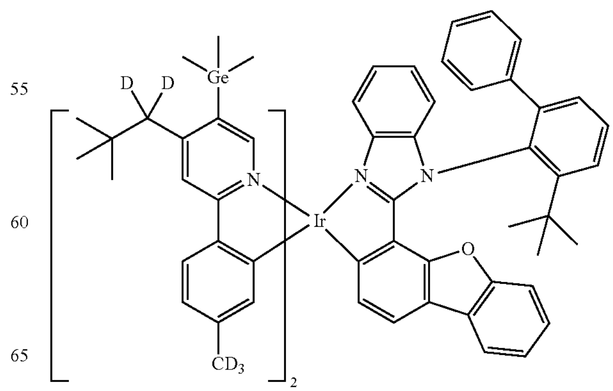

-continued
794
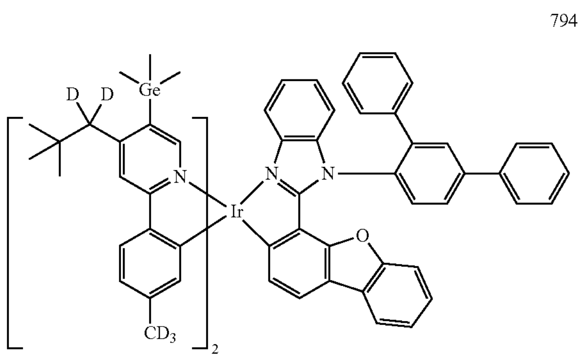
795
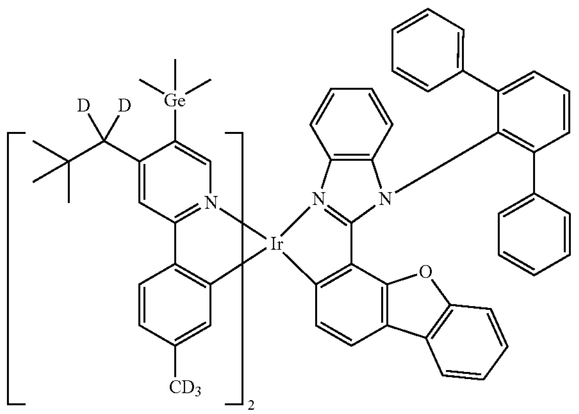
796
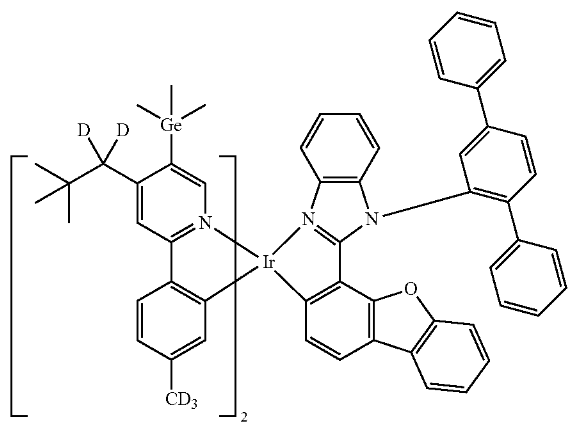
797
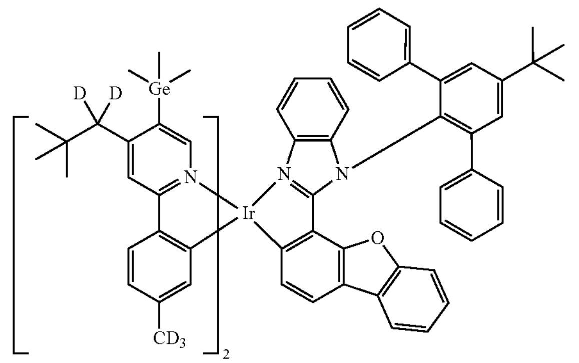
-continued
798
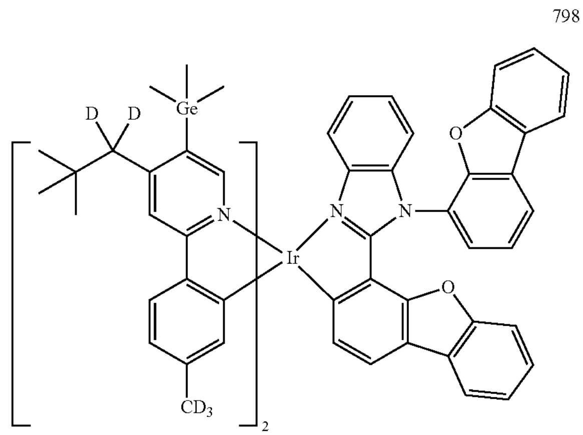
799
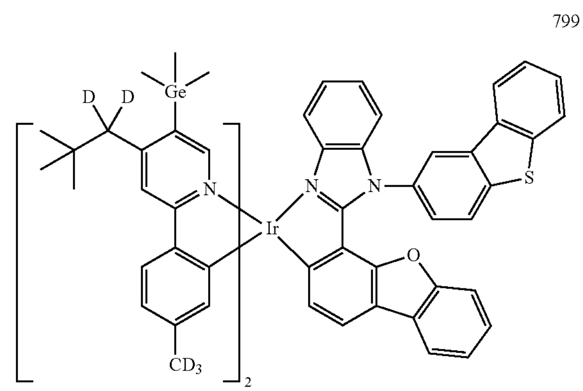
800
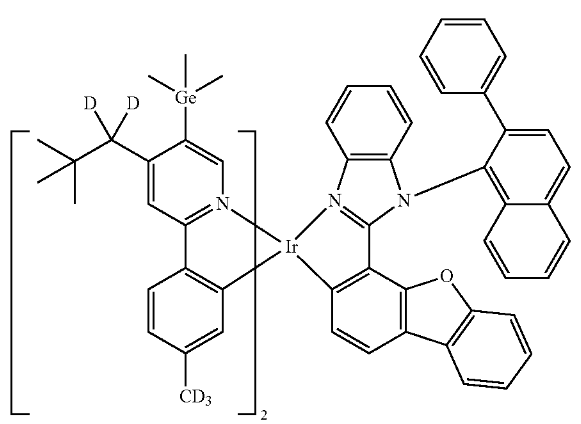
801
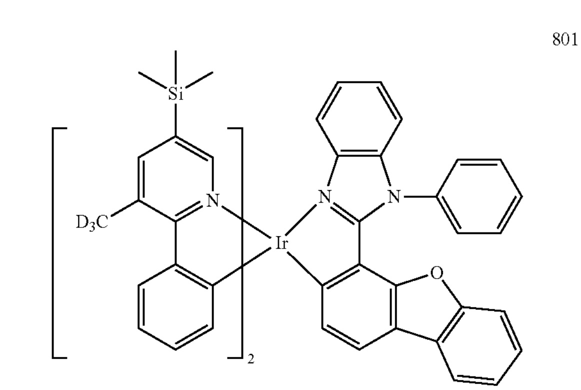

-continued
802
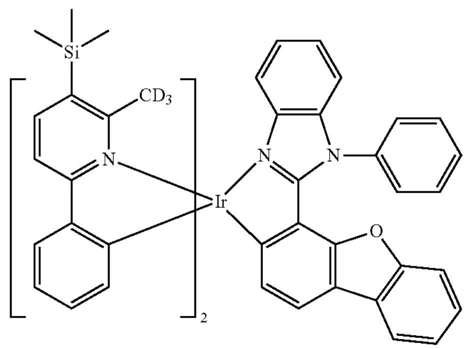
803
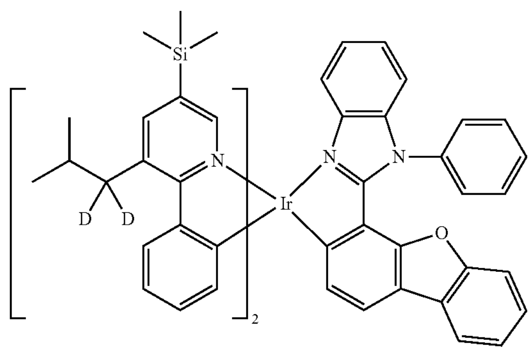
804
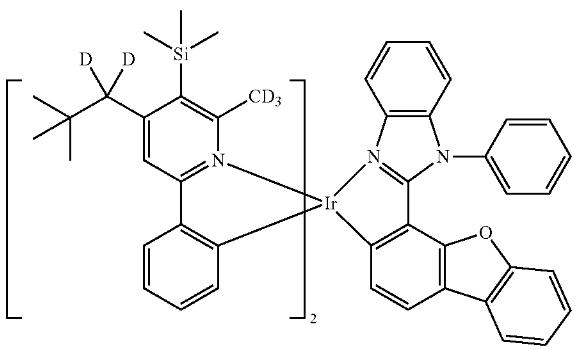
805
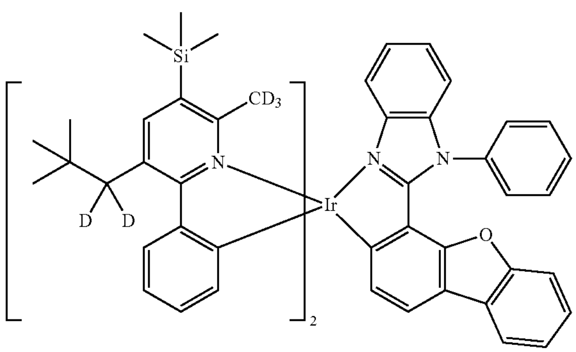
-continued
806
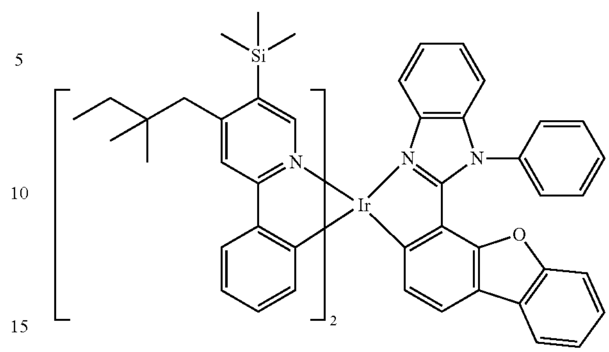
807
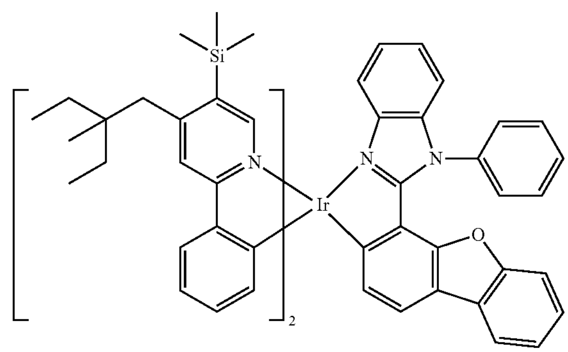
808
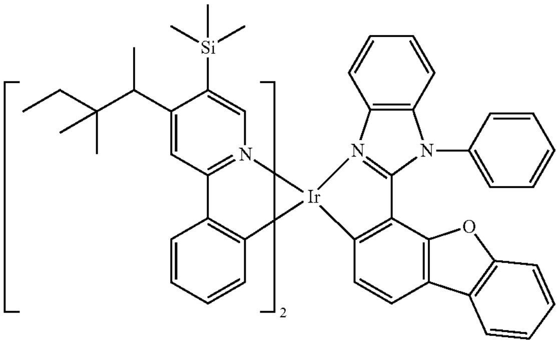
809
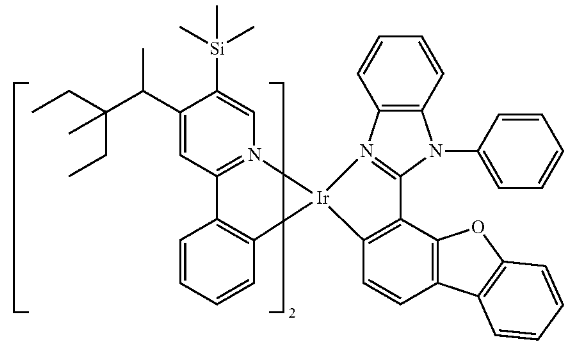

-continued
810
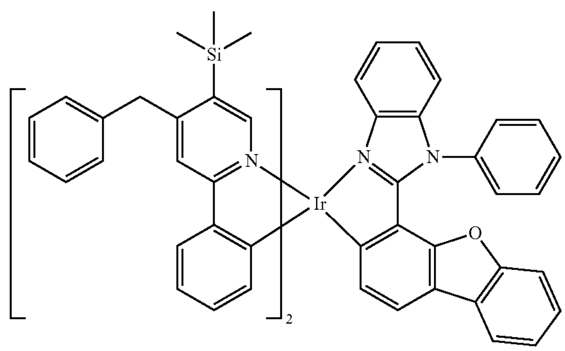
811
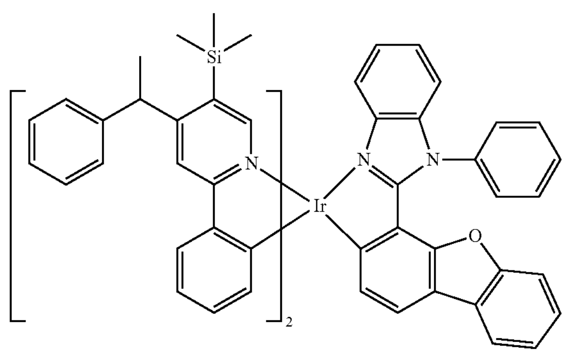
812
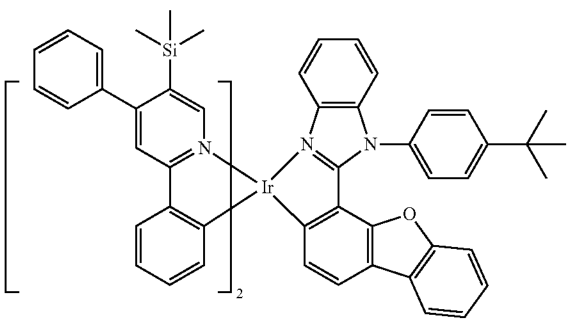
813
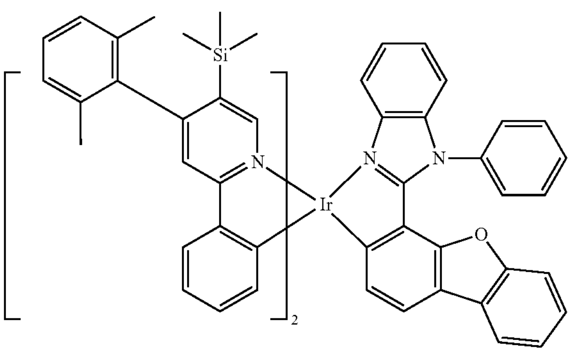
-continued
814
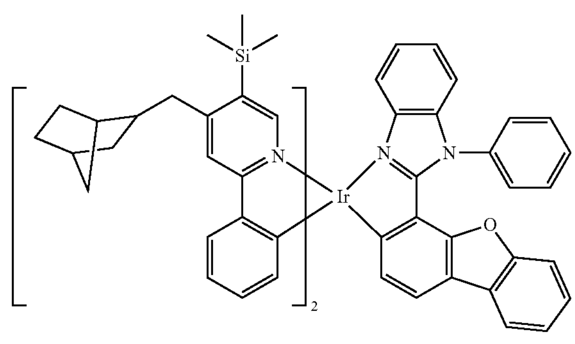
815
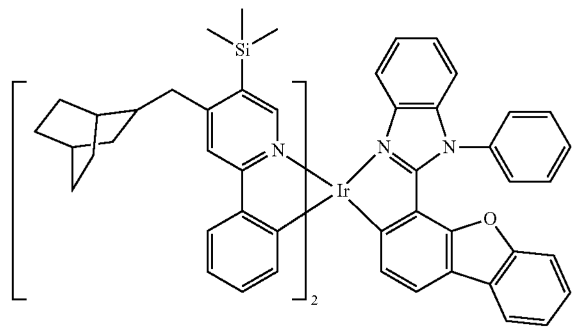
816
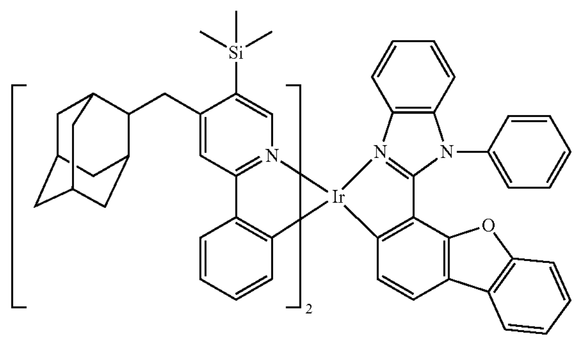
817
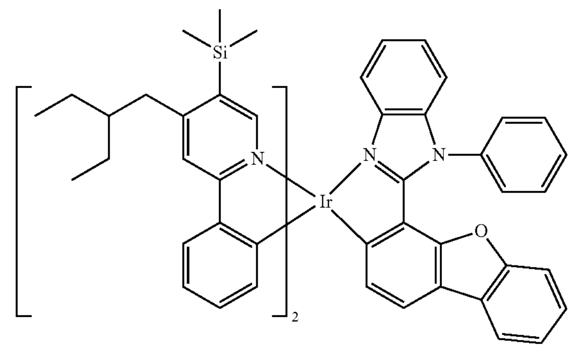

-continued
818
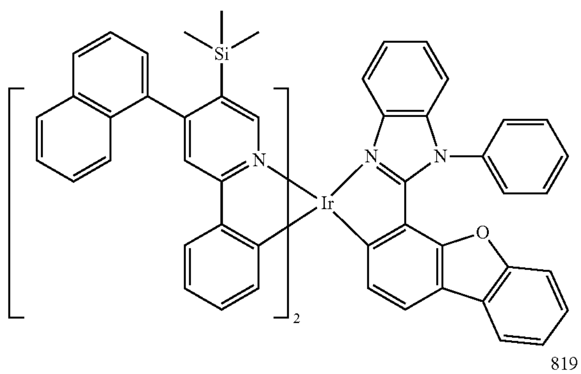
819
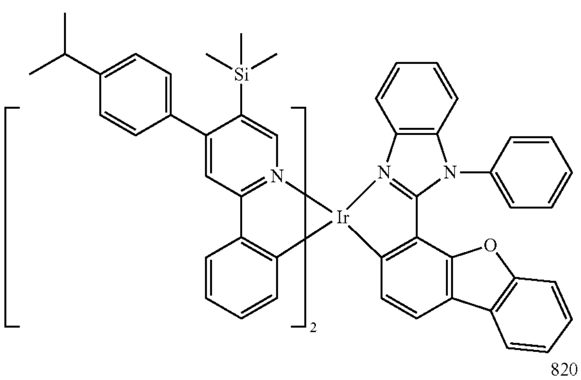
820
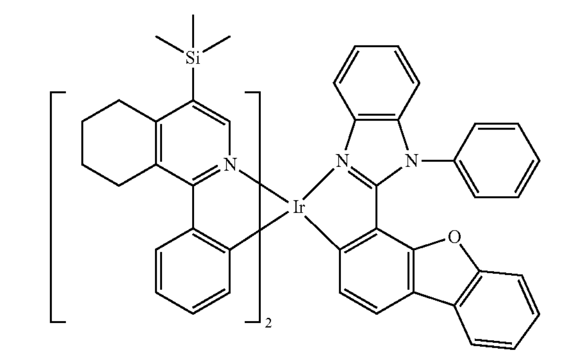
821
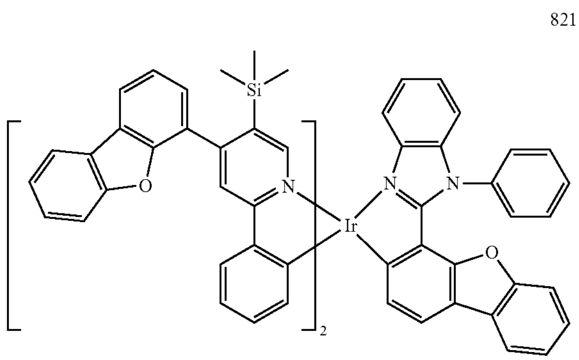
-continued
822
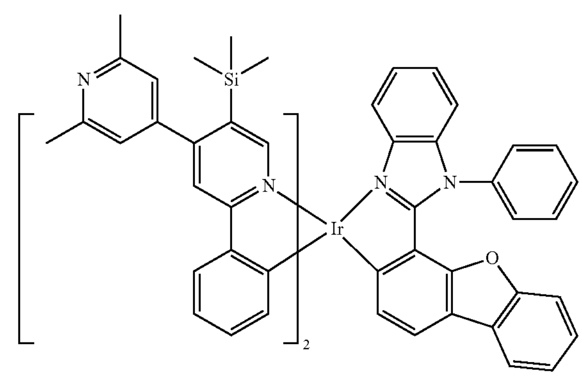
823
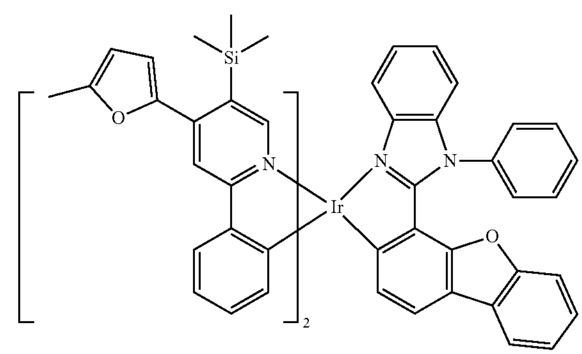
824
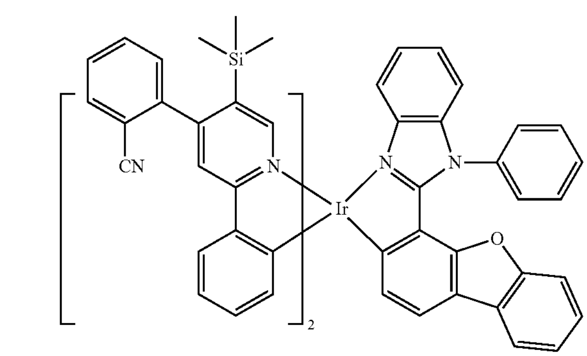
825
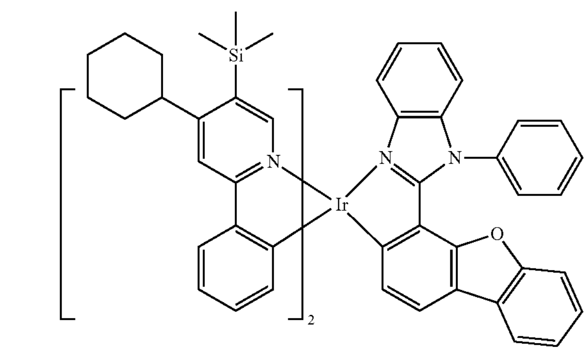

-continued
826
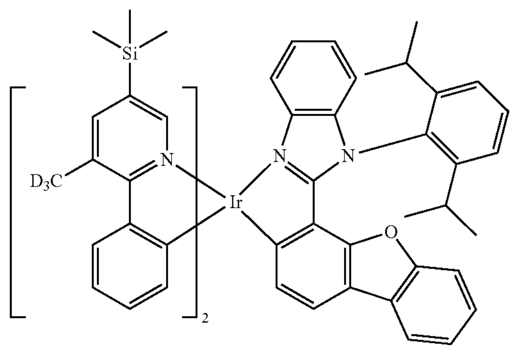
827
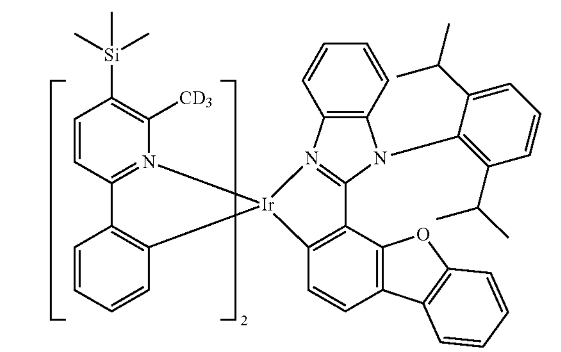
828
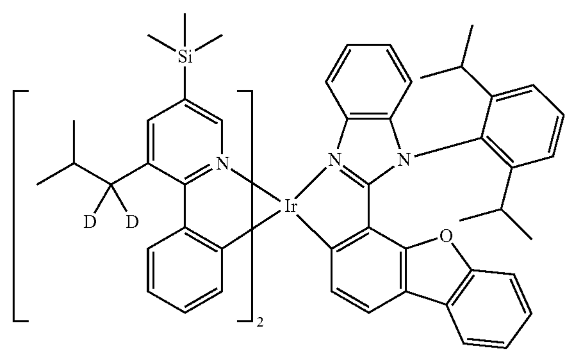
829
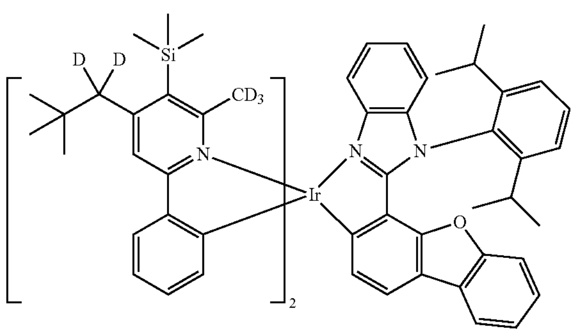
-continued
830
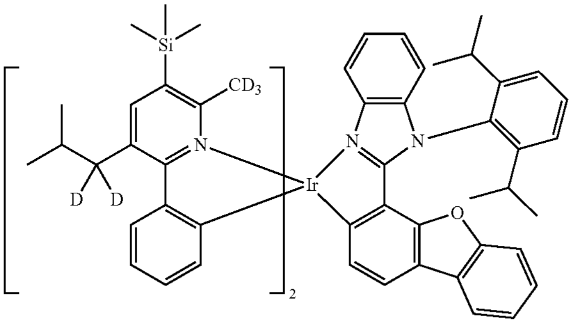
831
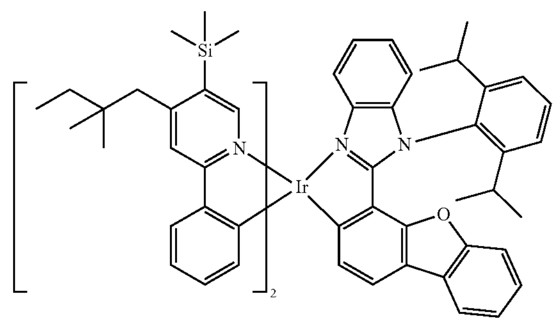
832
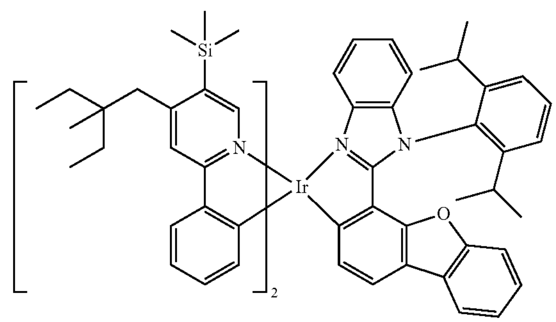
833
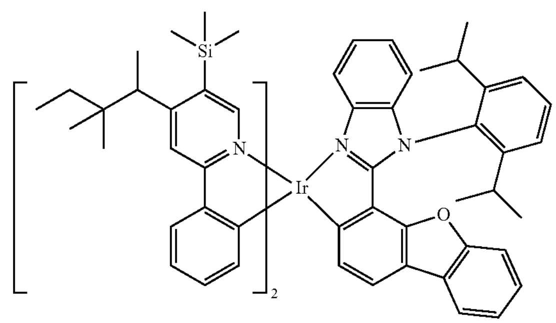

-continued
834
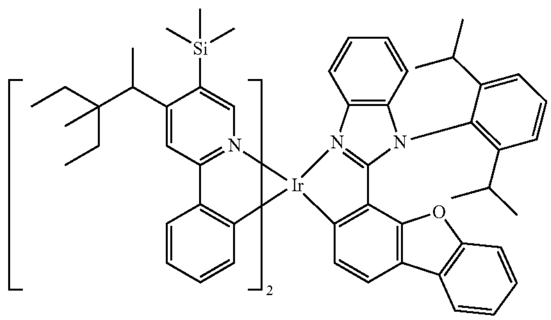
835
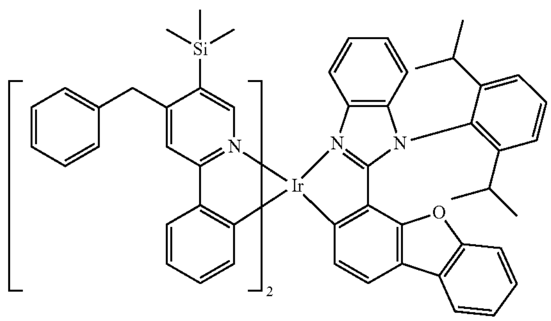
836
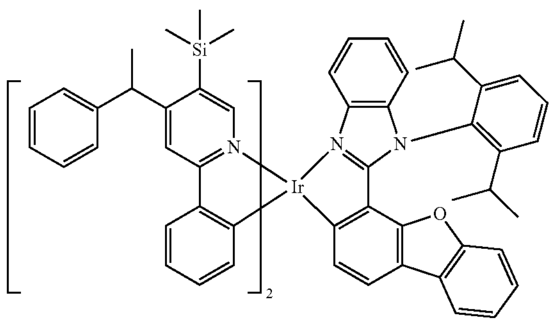
837
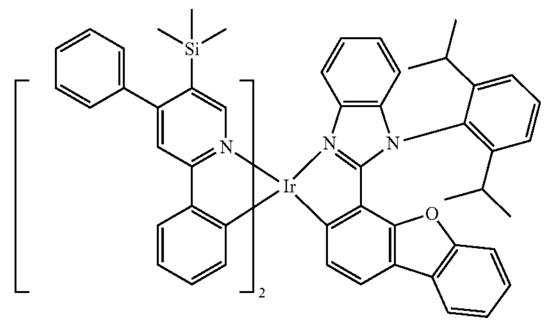
-continued
838
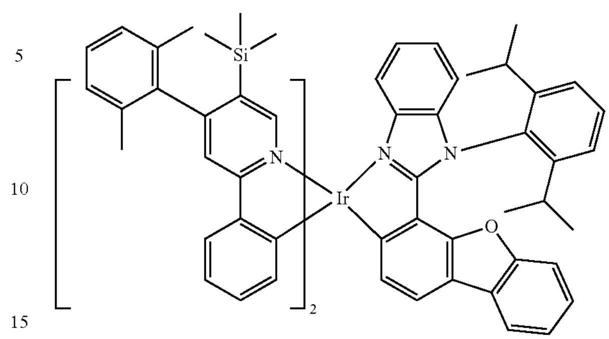
839
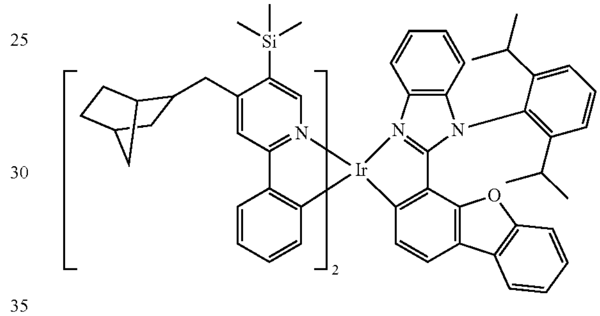
840
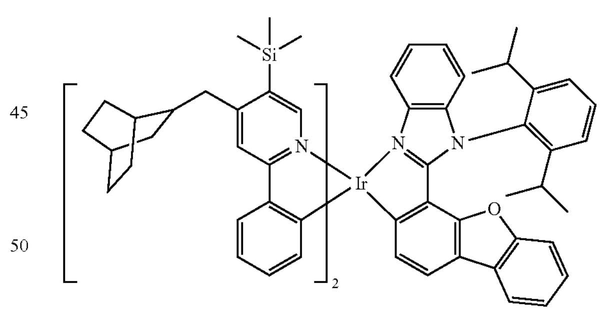
841
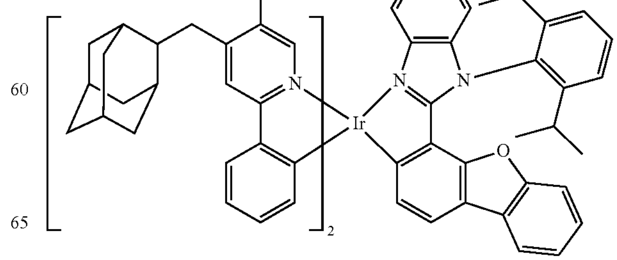

-continued
842
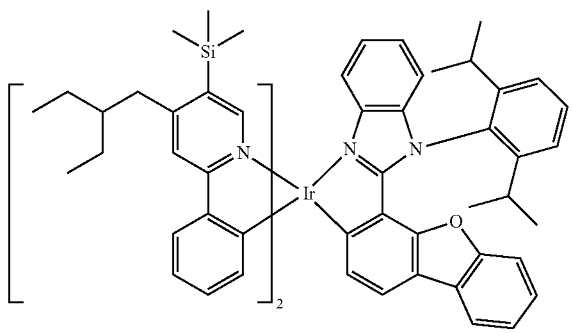
843
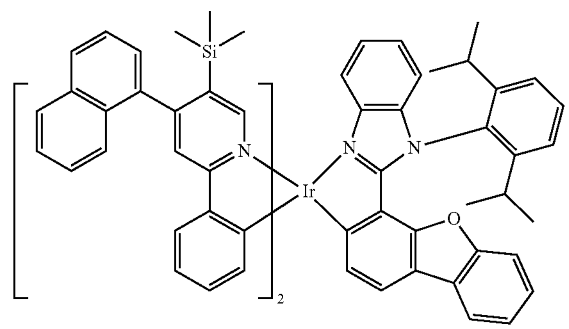
844
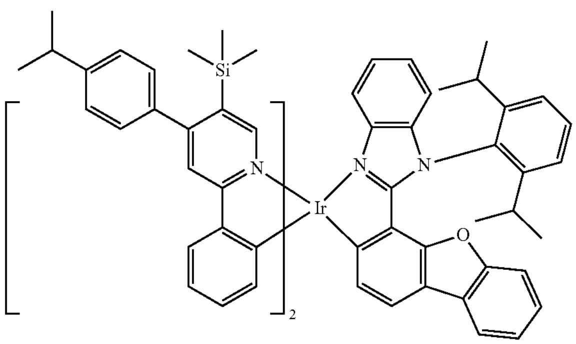
845
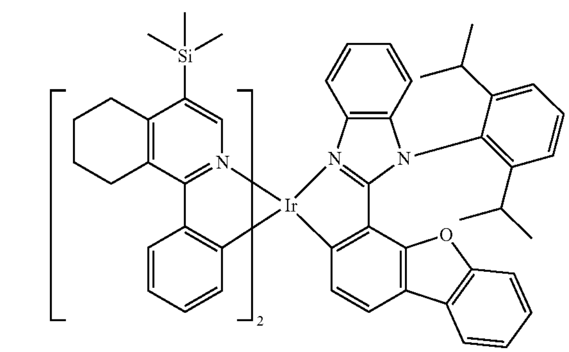
-continued
846
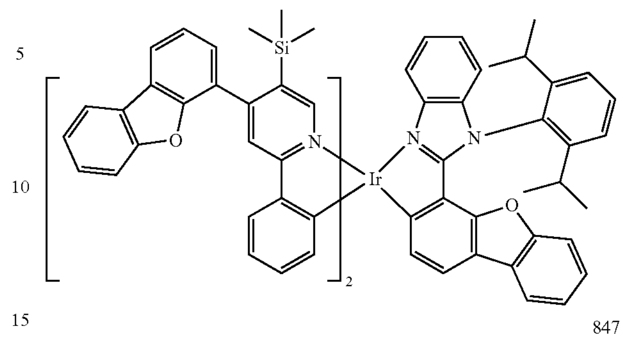
847
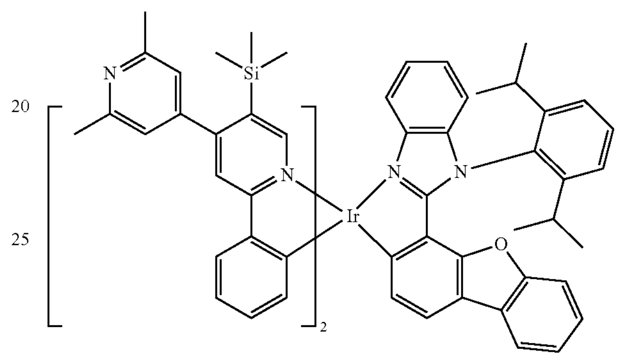
848
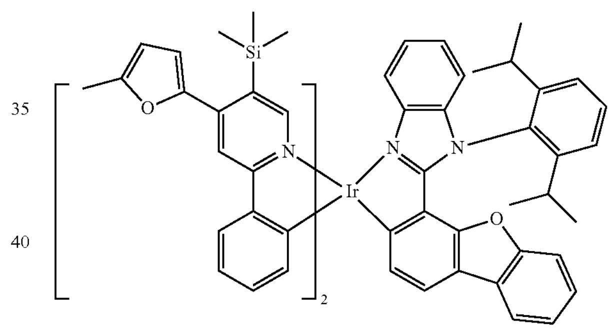
849
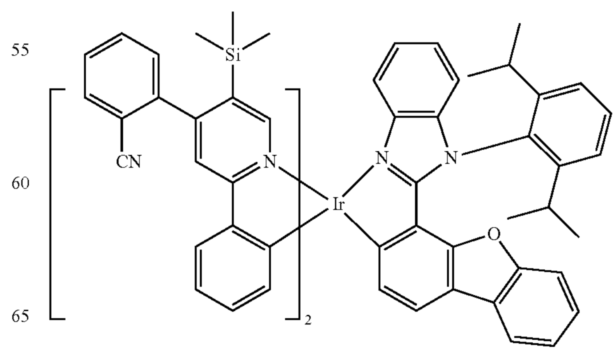

-continued
850
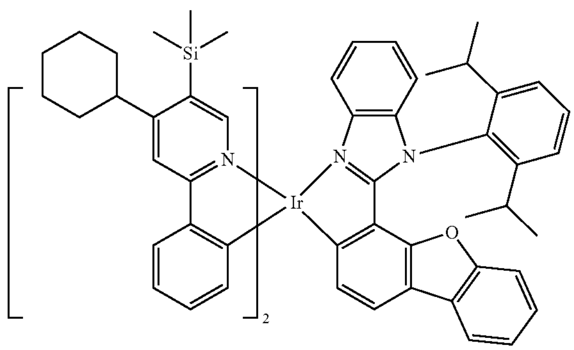
851
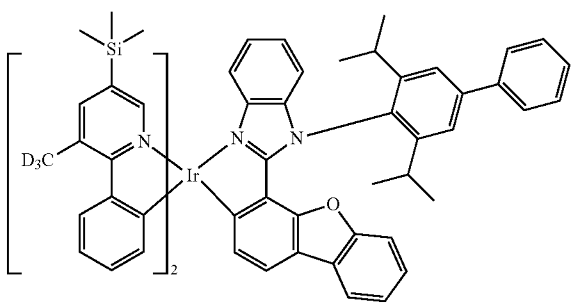
852
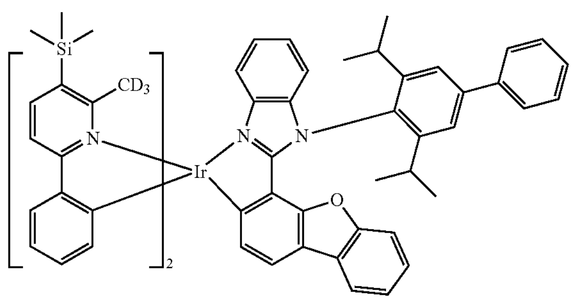
853
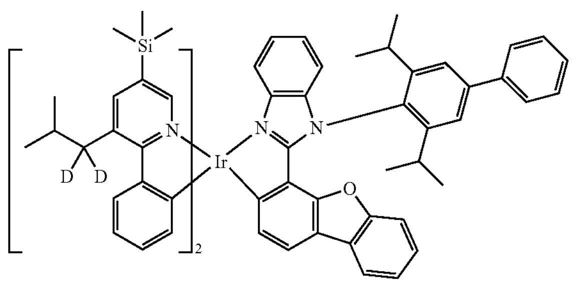
-continued
854
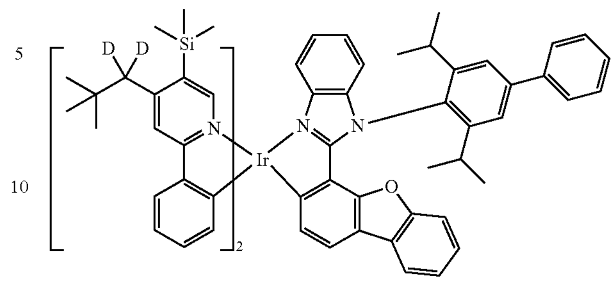
855
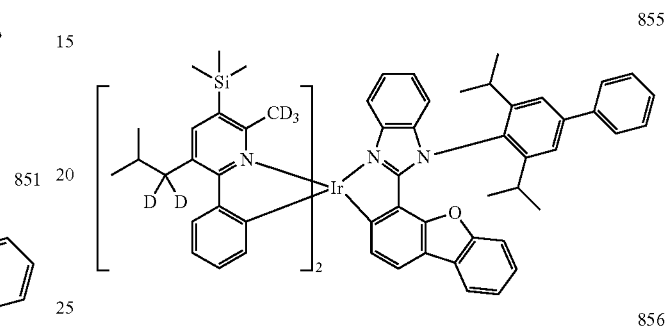
856
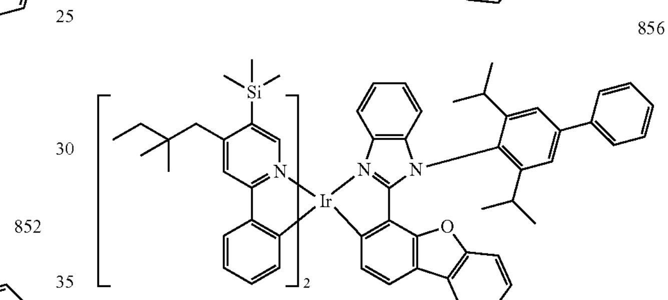
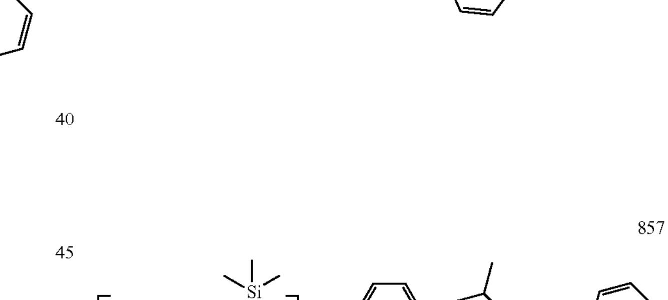
857
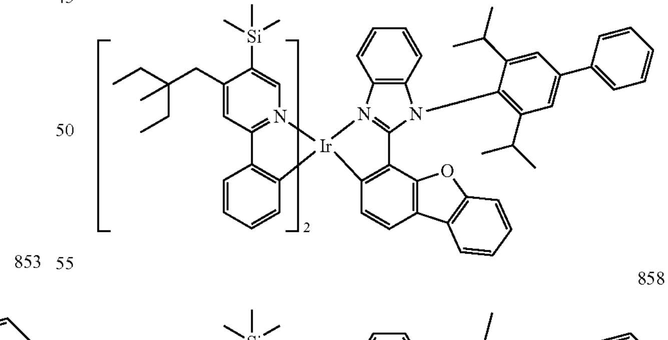
858
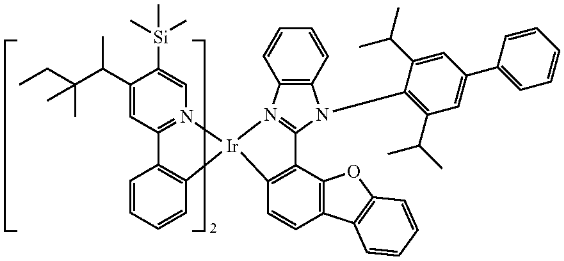

-continued
859
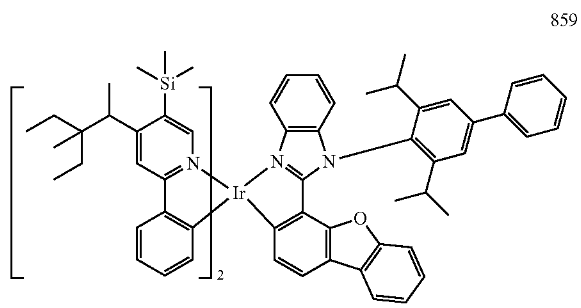
860
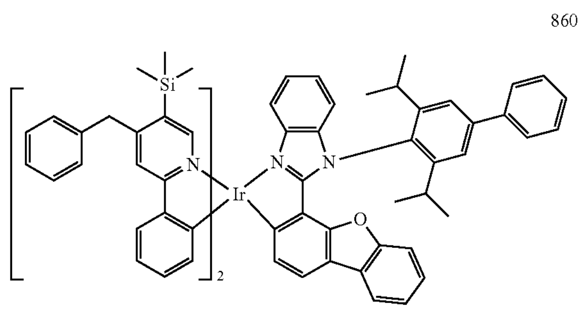
861
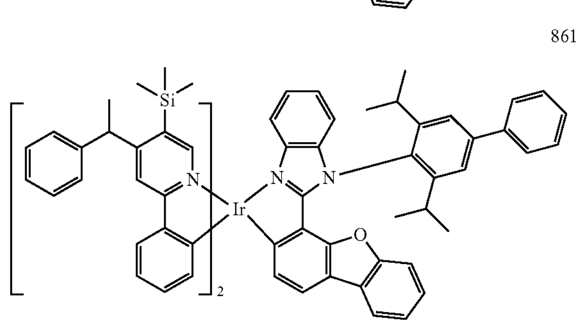
862
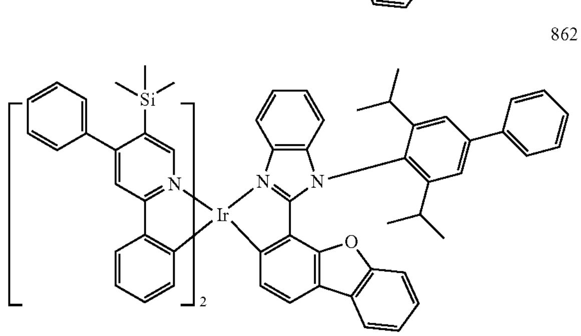
863
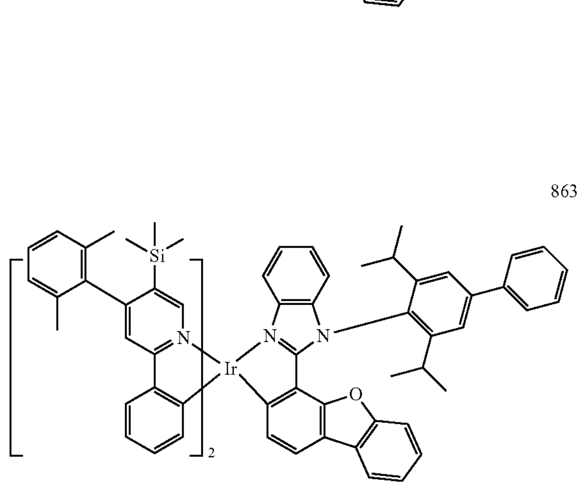
-continued
864
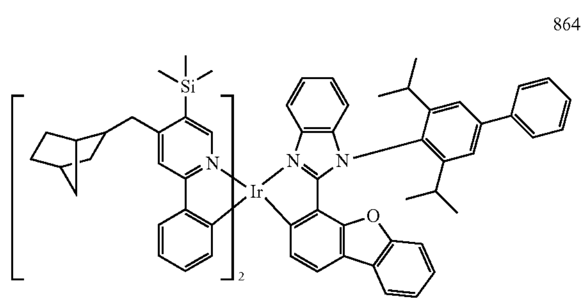
865
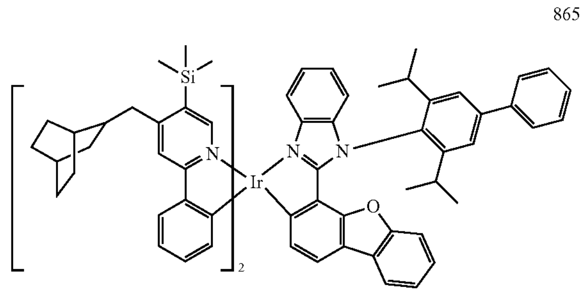
866
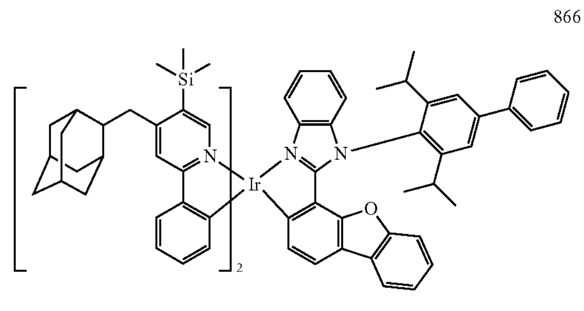
867
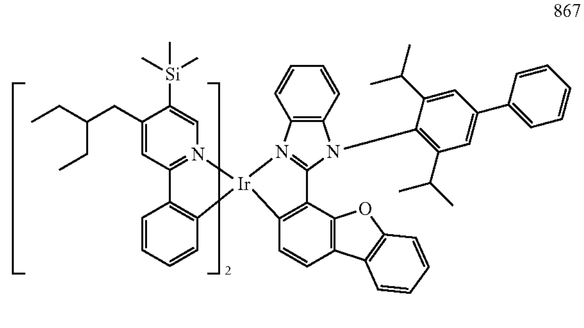
868
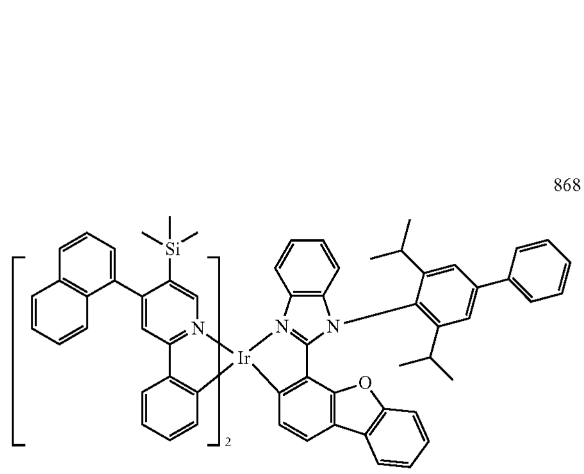

-continued
869
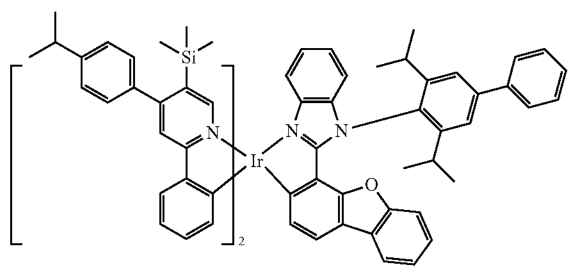
870
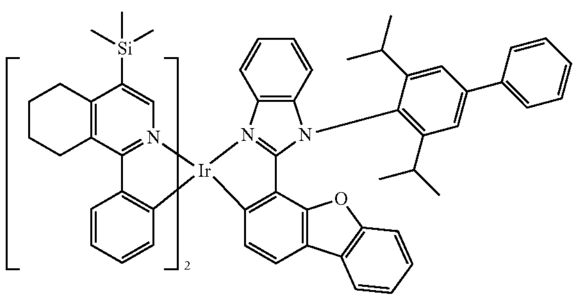
871
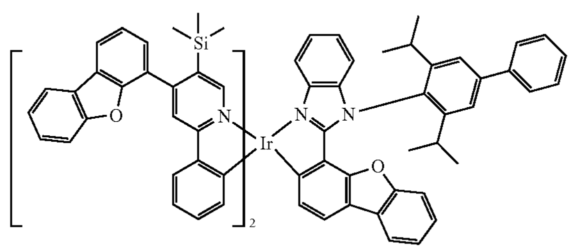
872
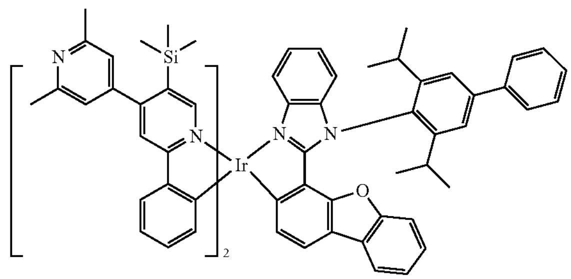
873
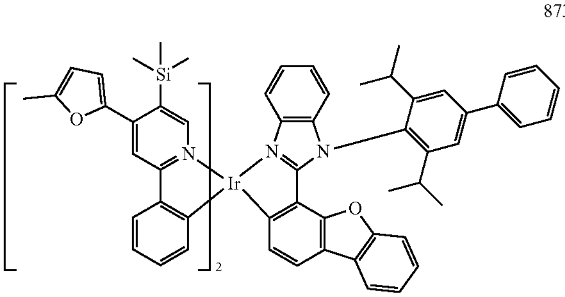
-continued
874
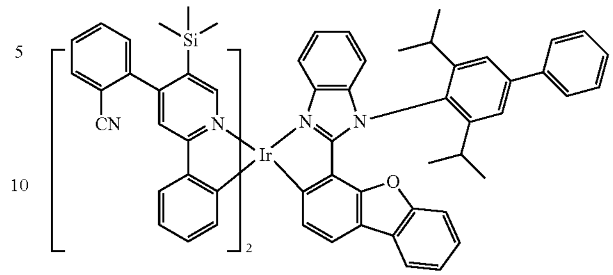
875
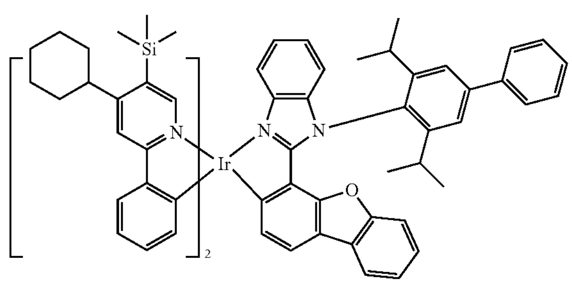
876
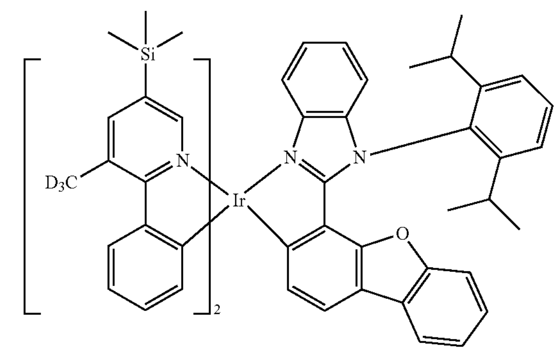
877
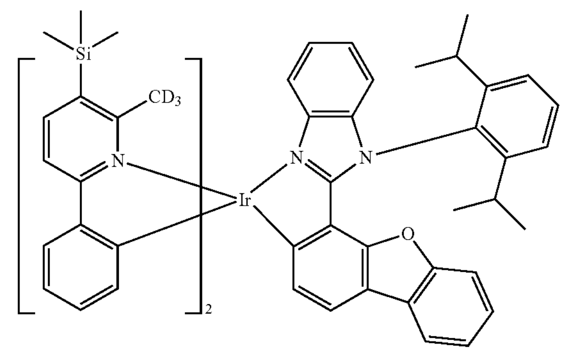

-continued
879
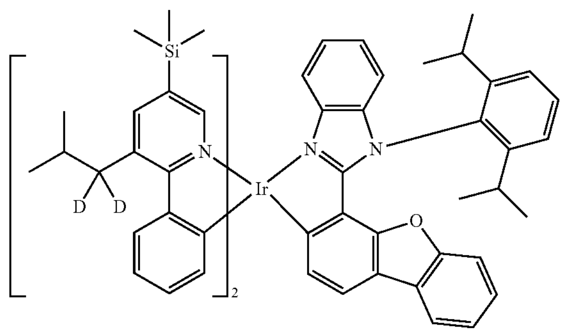
879
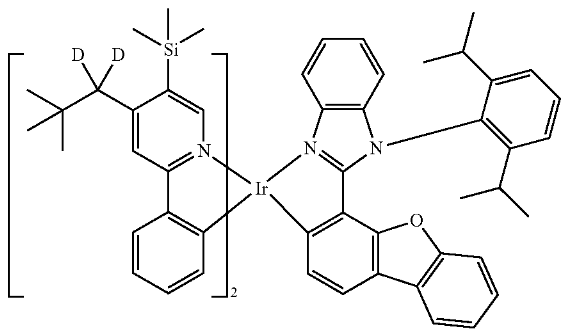
880
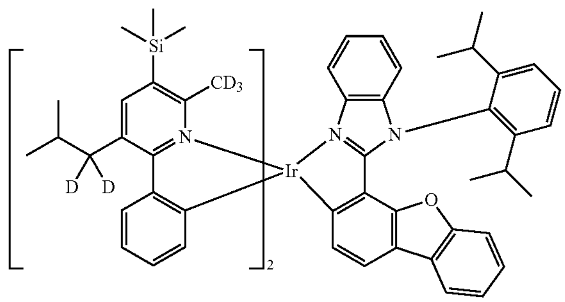
881
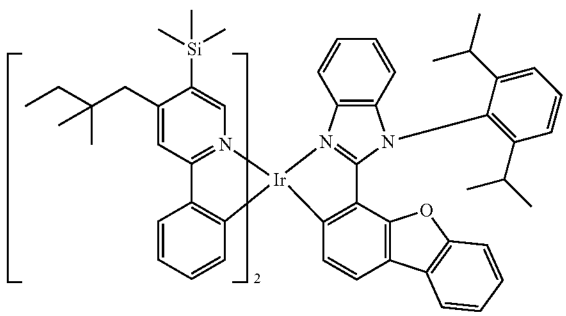
-continued
882
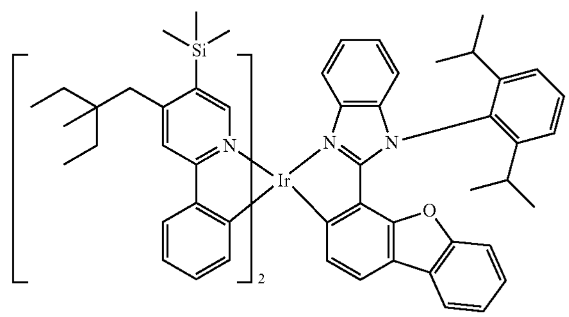
883
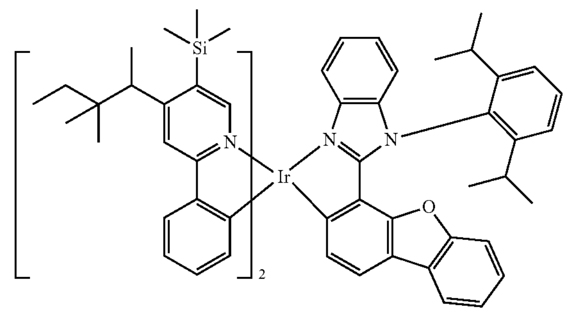
884
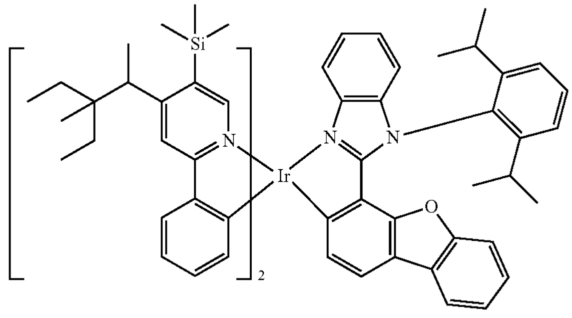
885
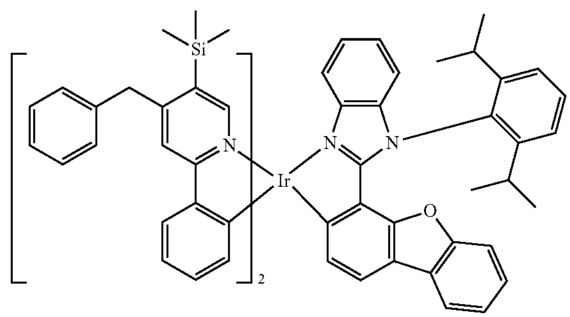

-continued
886
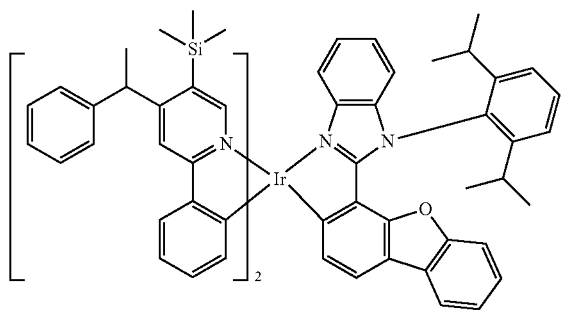
887
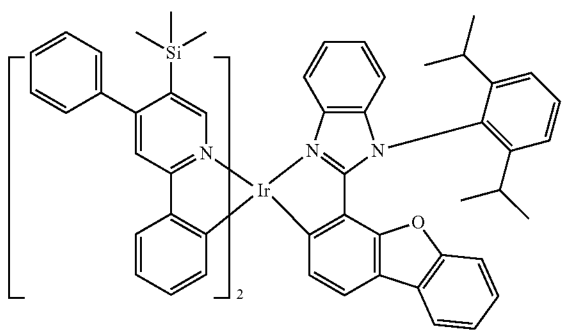
888
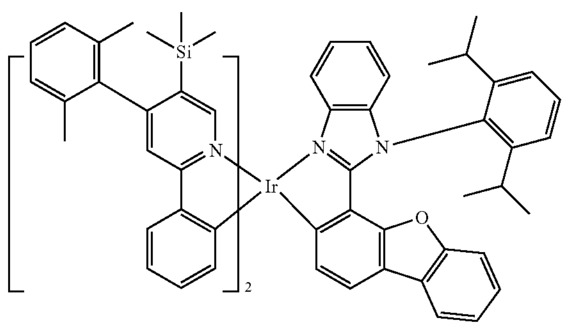
889
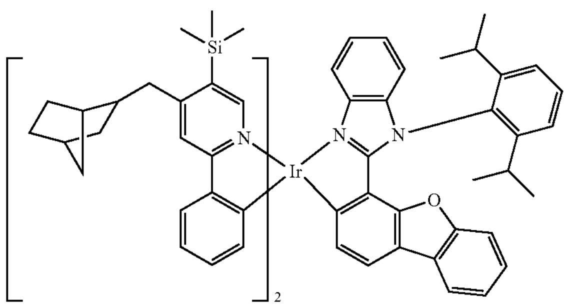
-continued
890
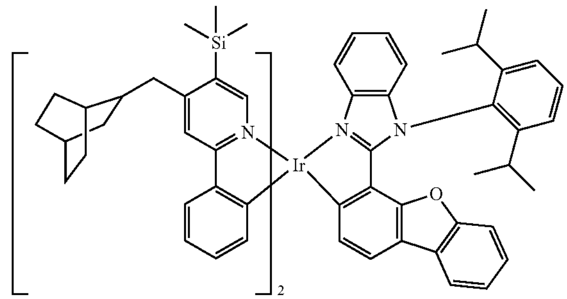
891
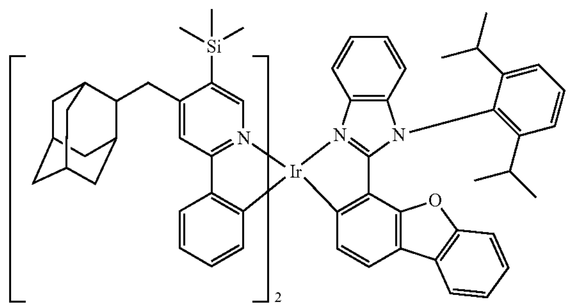
892
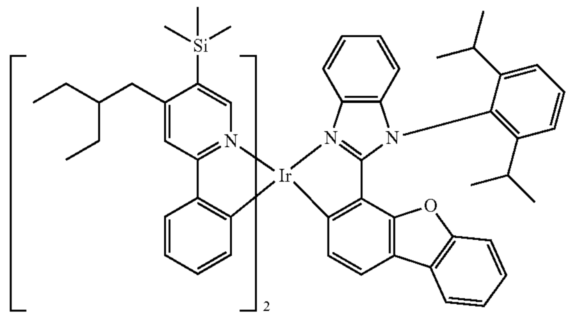
893
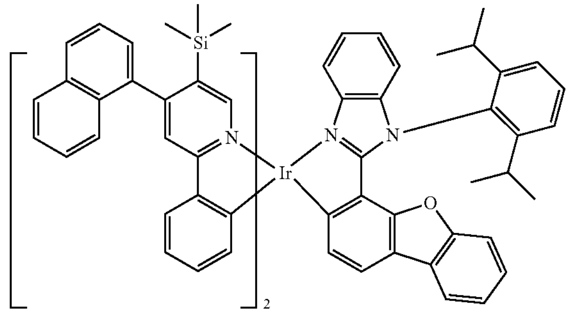

-continued
894
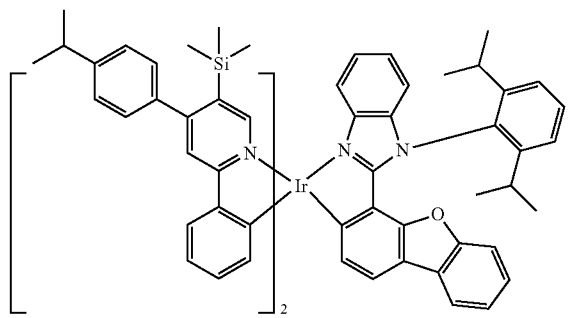
895
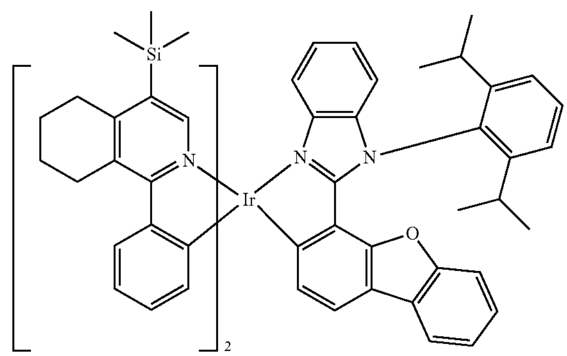
896
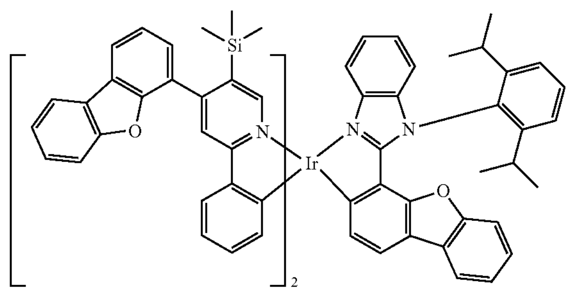
897
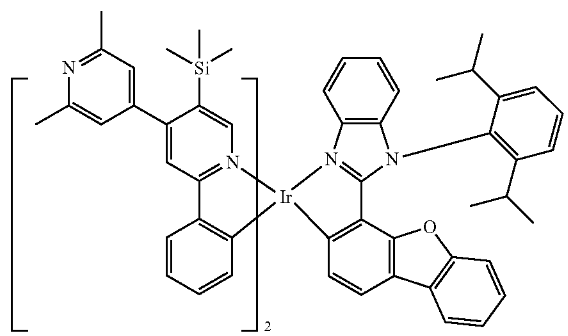
-continued
898
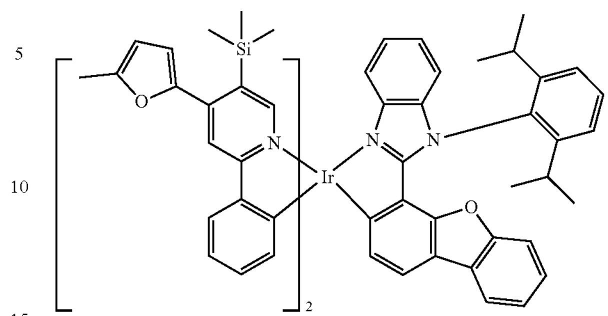
899
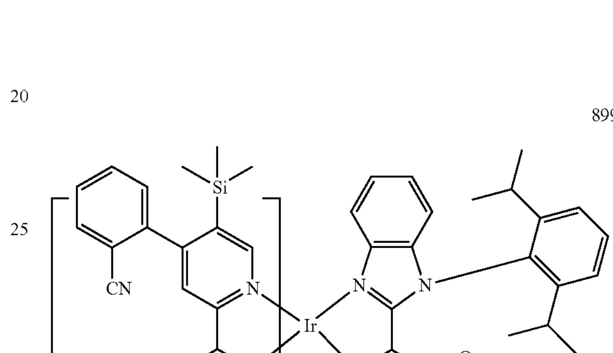
900
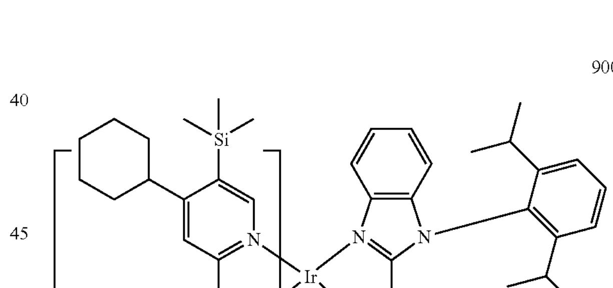
901
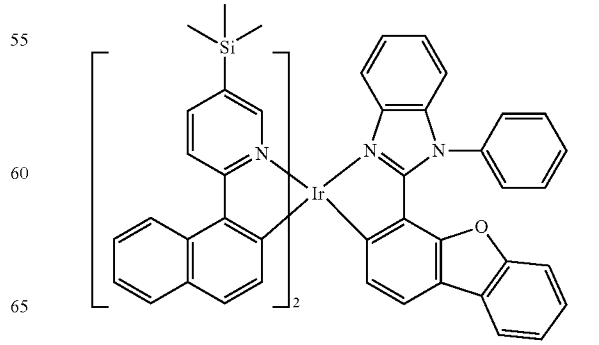

-continued
902
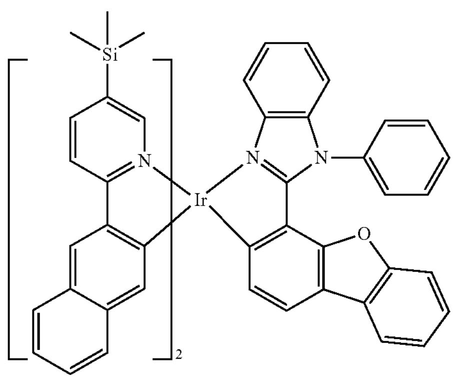
903
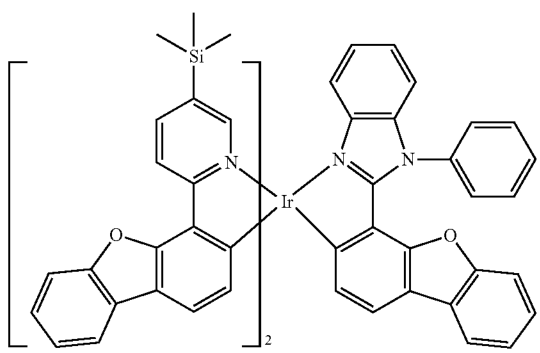
904
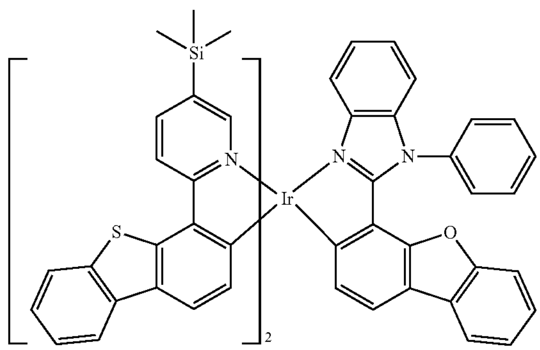
905
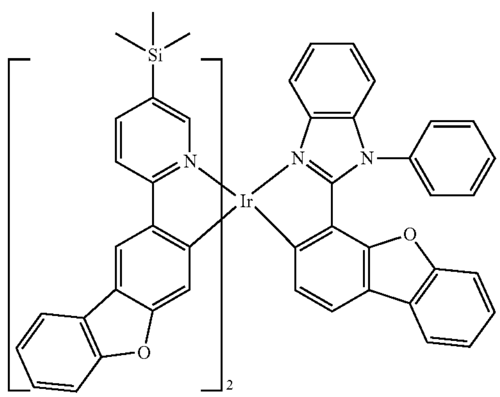
-continued
906
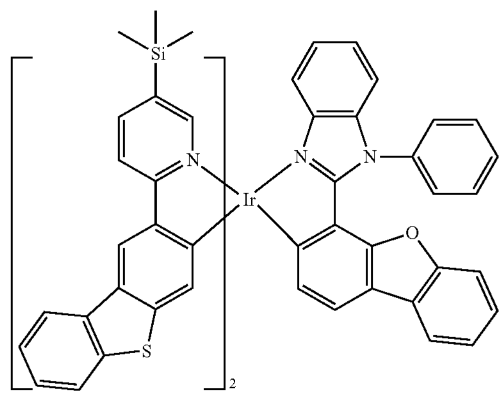
907
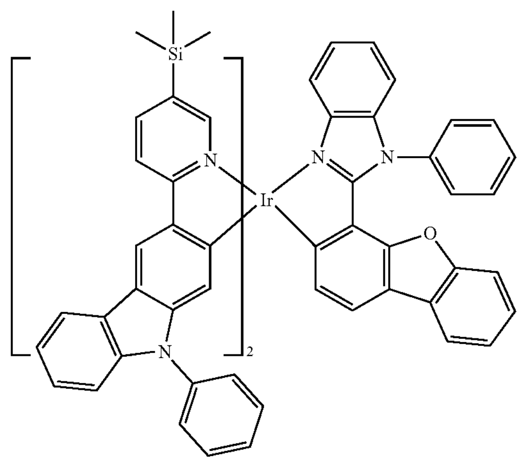
908
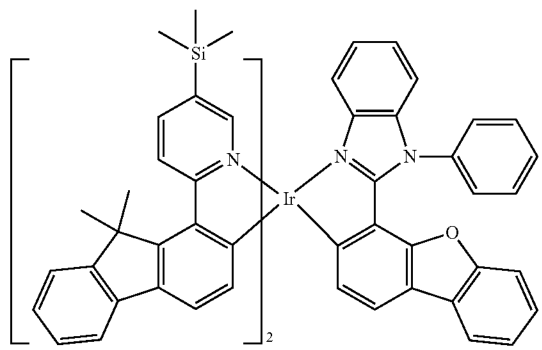
909
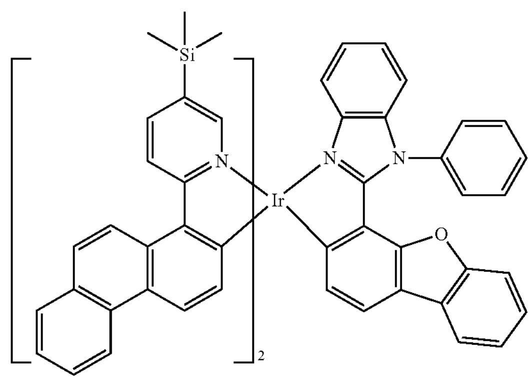

-continued
910
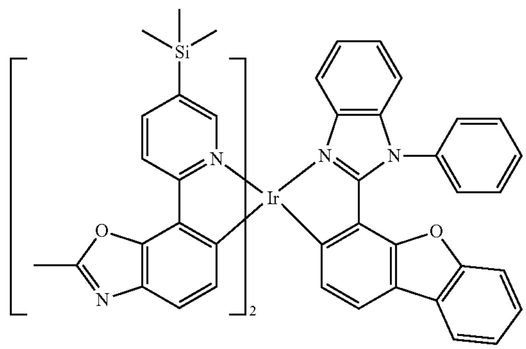
911
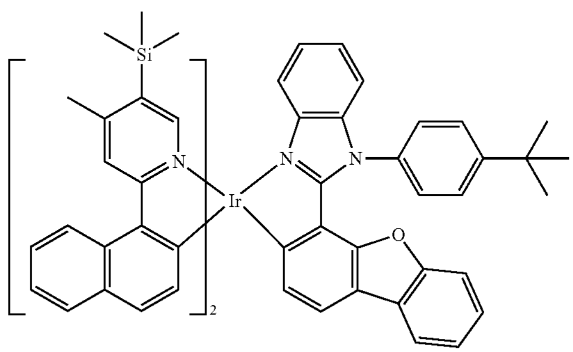
912
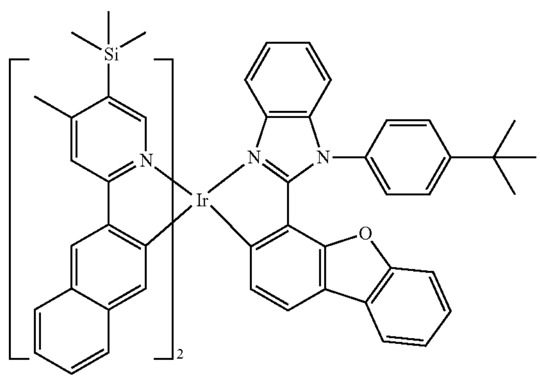
913
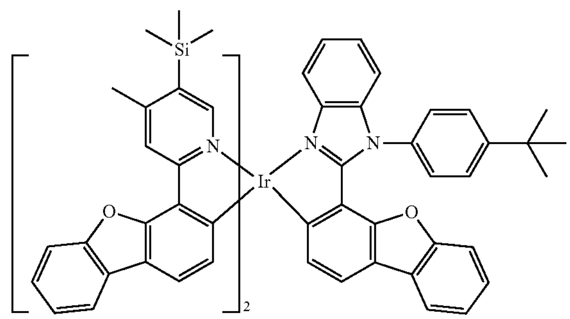
-continued
914
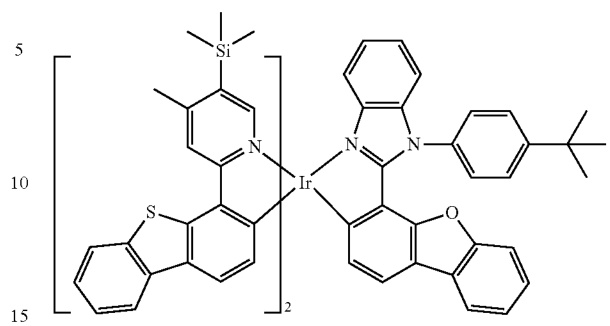
915
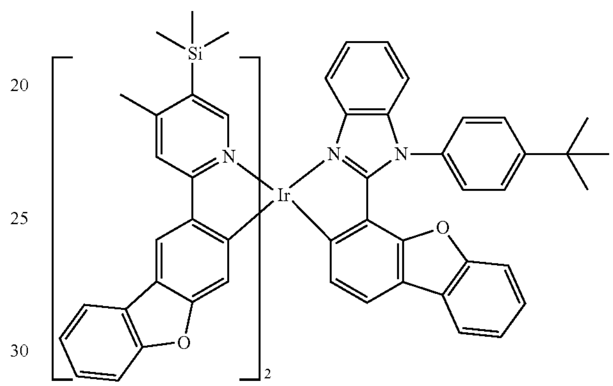
916
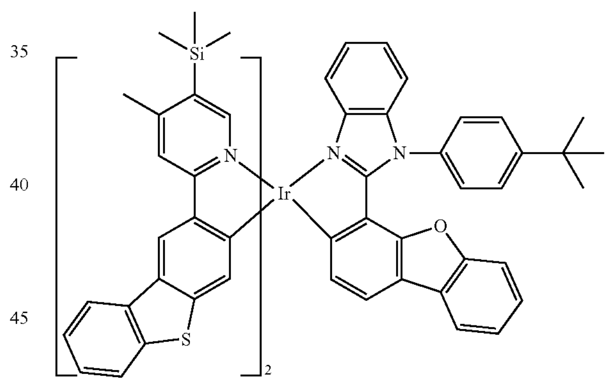
917
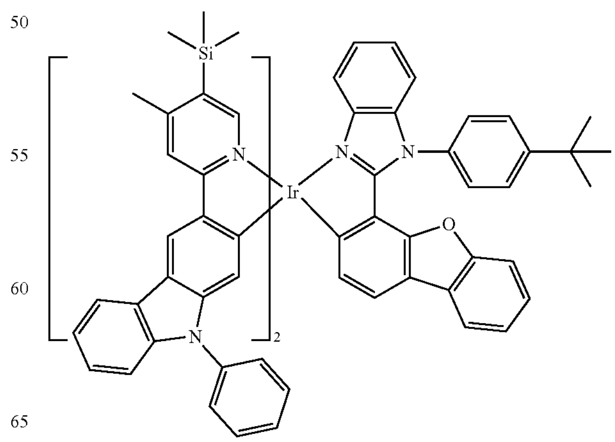

-continued
918
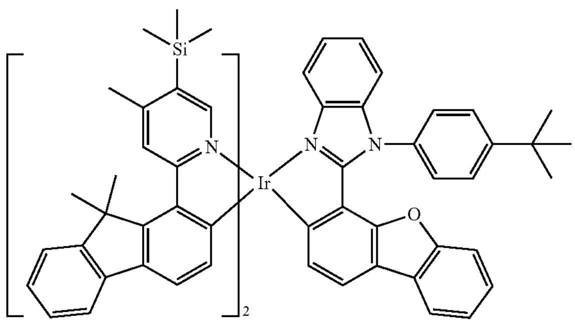
919
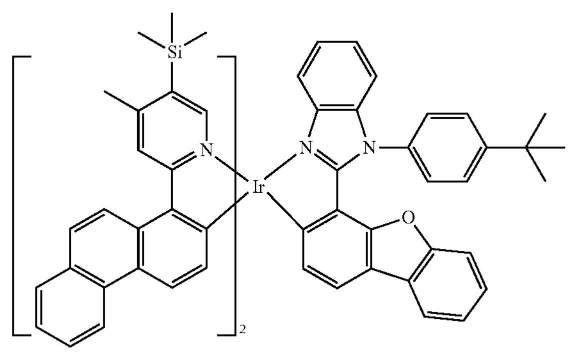
920
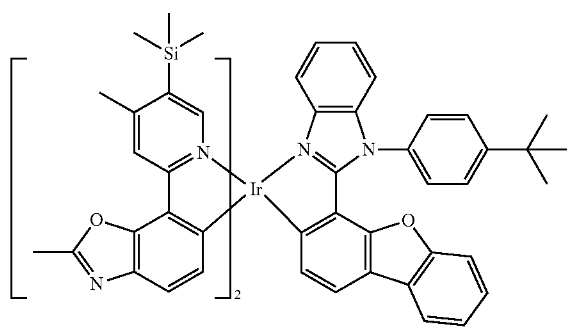
921
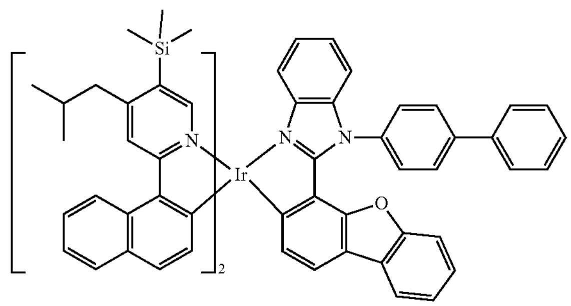
-continued
922
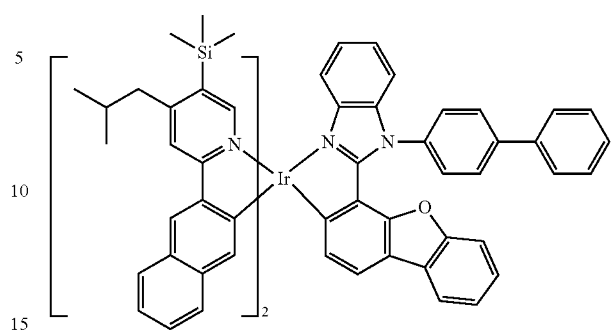
923
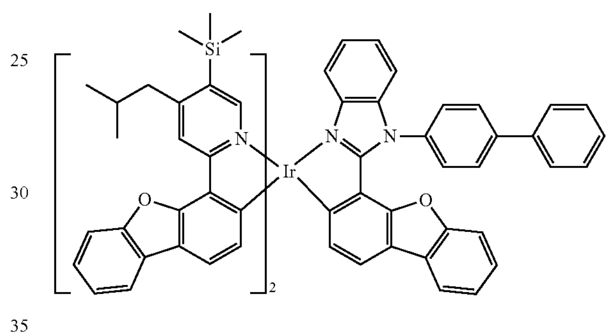
924
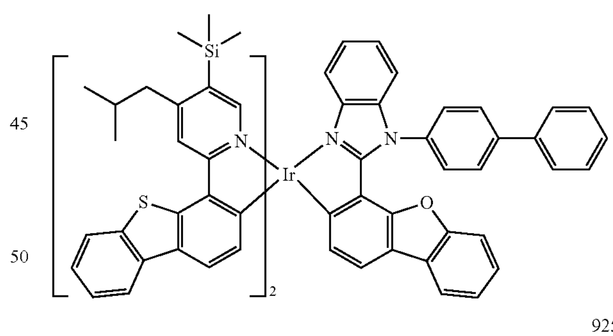
925
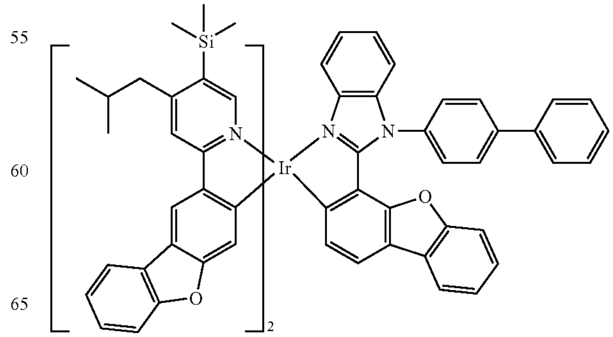

-continued
926
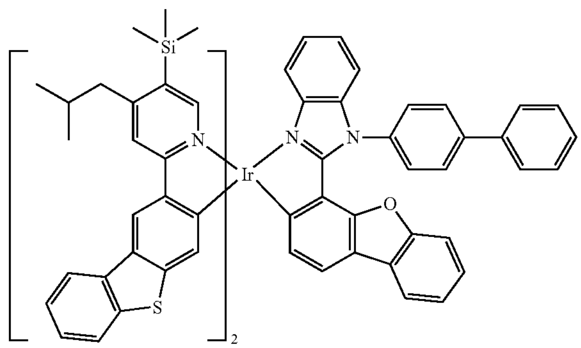
927
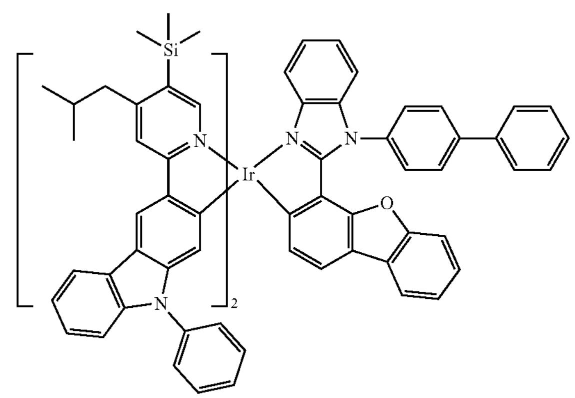
928
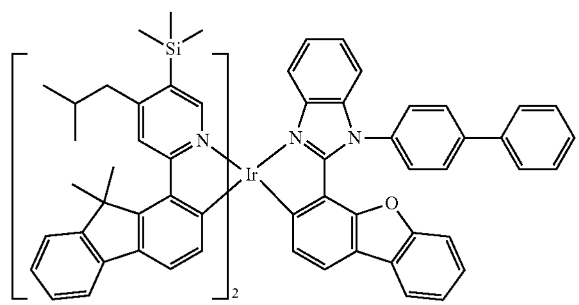
929
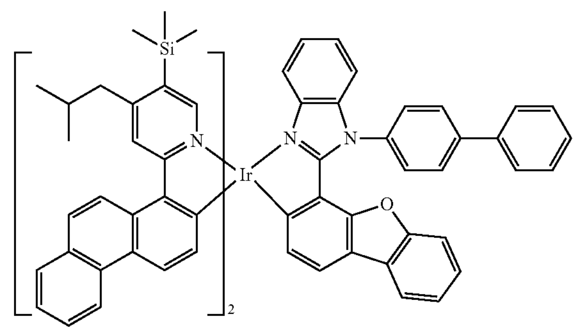
-continued
930
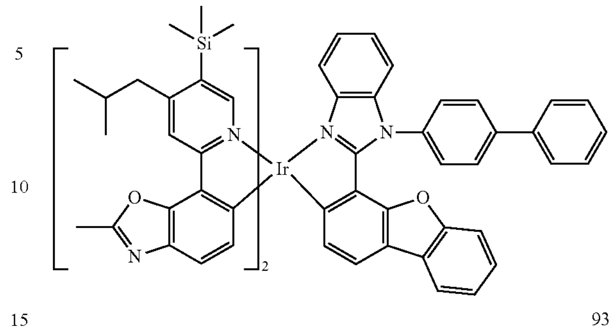
931
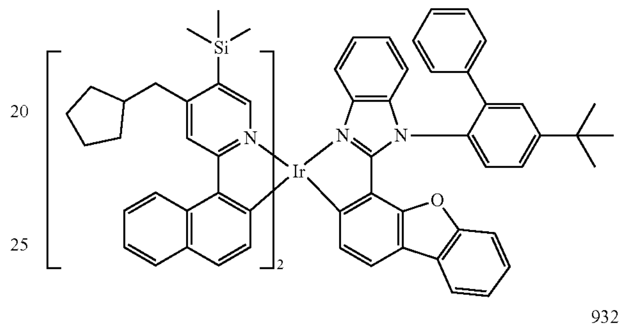
932
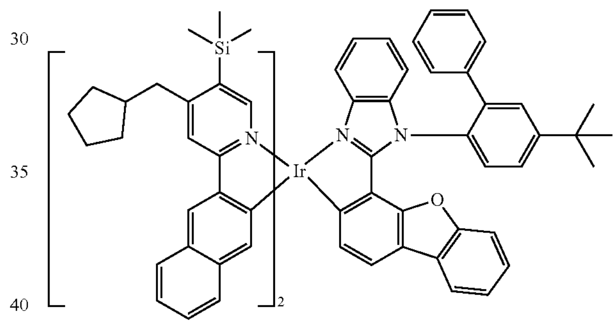
933
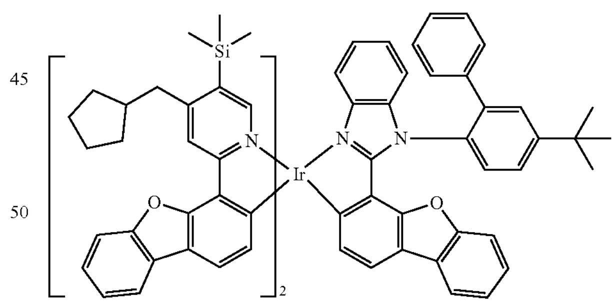
934
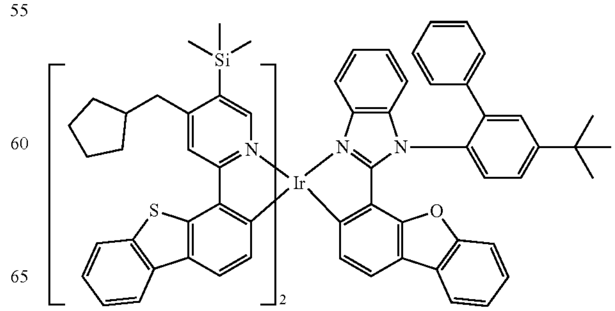

-continued
935
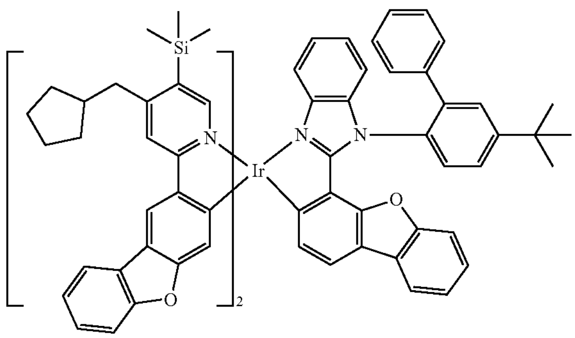
936
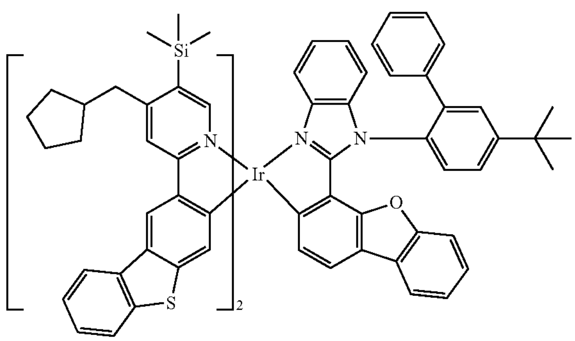
937
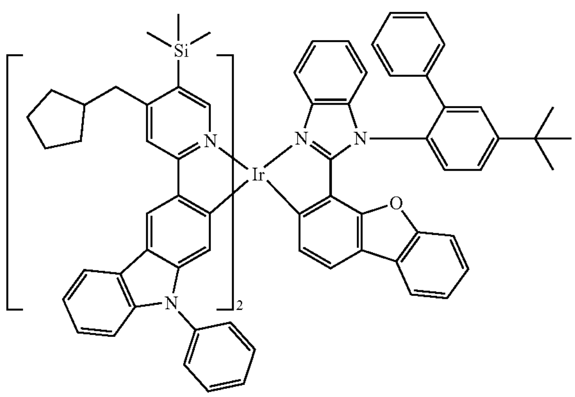
938
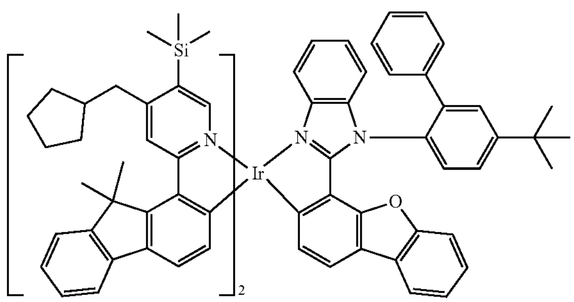
-continued
939
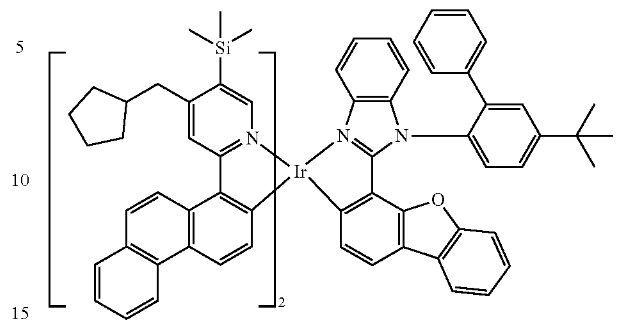
940
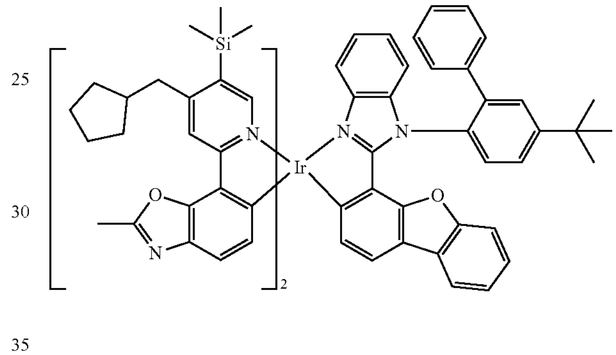
941
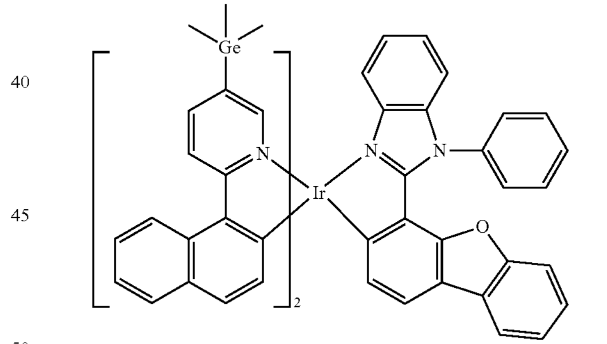
942
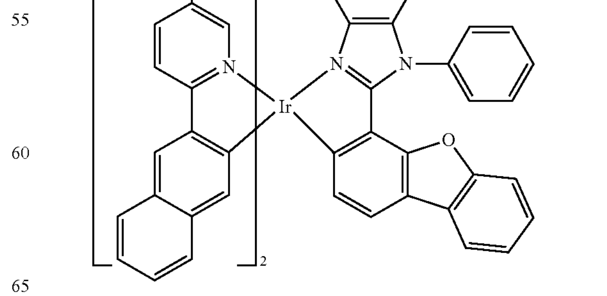

-continued
943
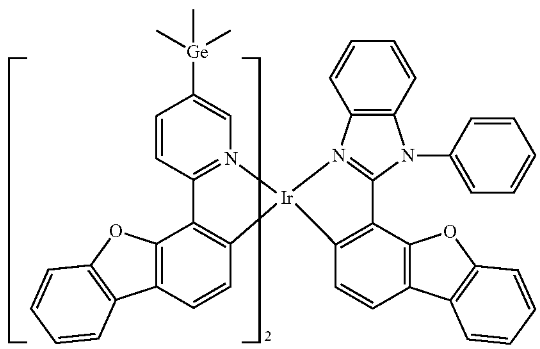
944
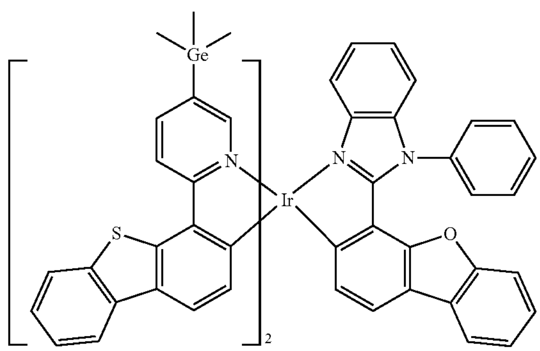
945
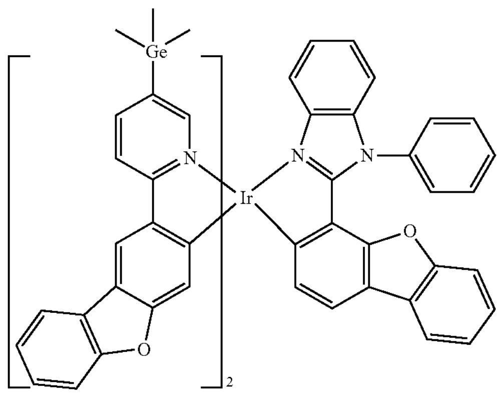
946
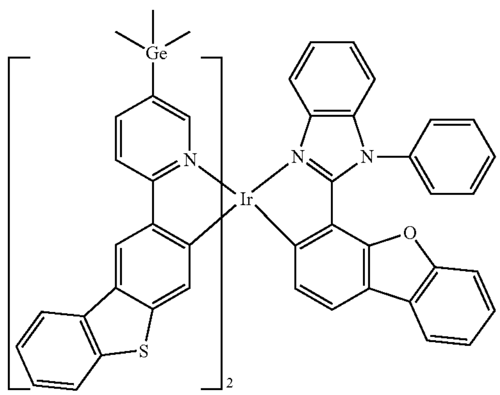
-continued
947
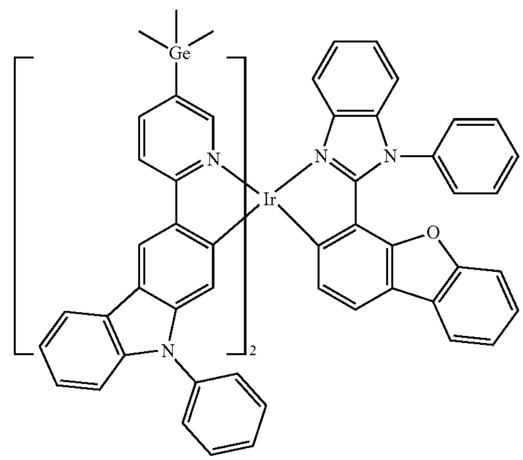
948
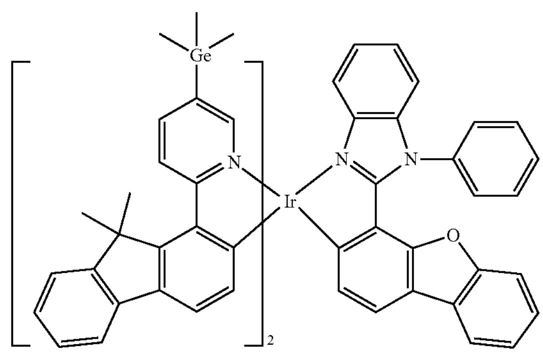
949
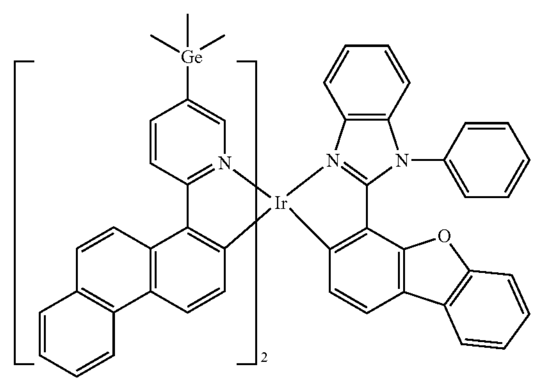
950
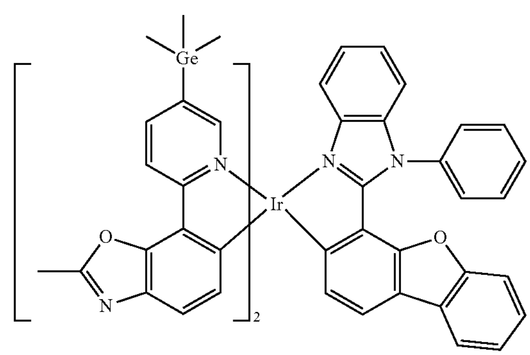

-continued
951
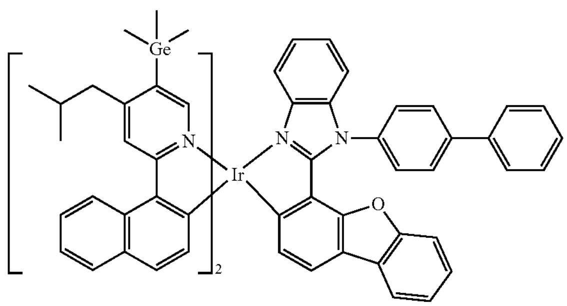
952
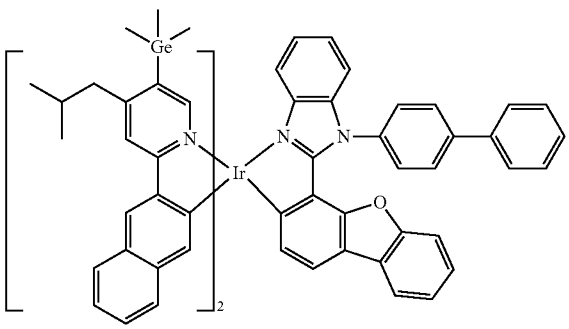
953
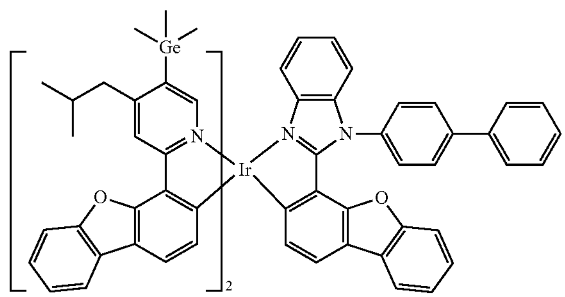
954
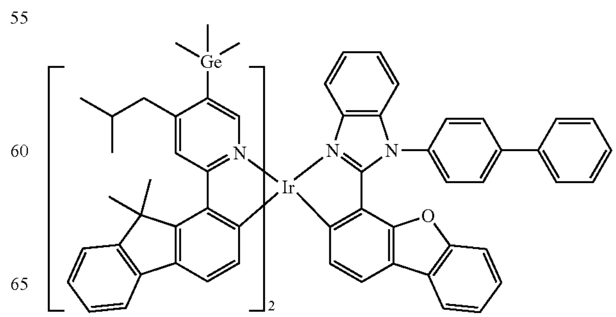
-continued
955
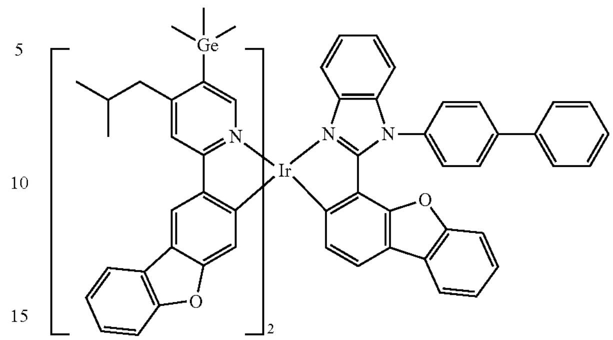
956
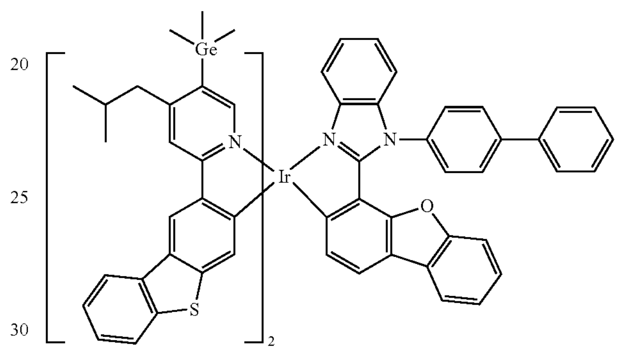
957
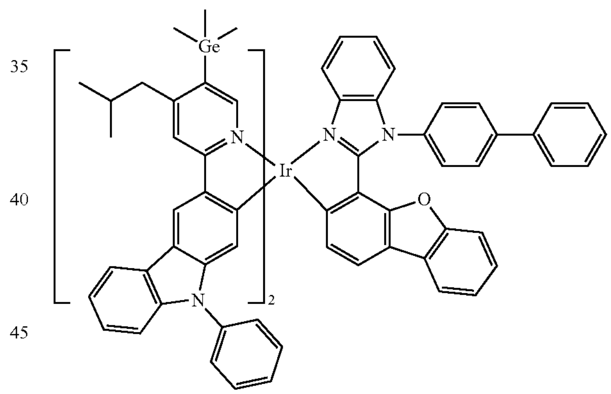
958
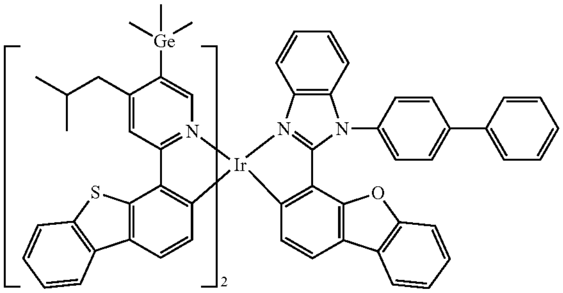

-continued
959
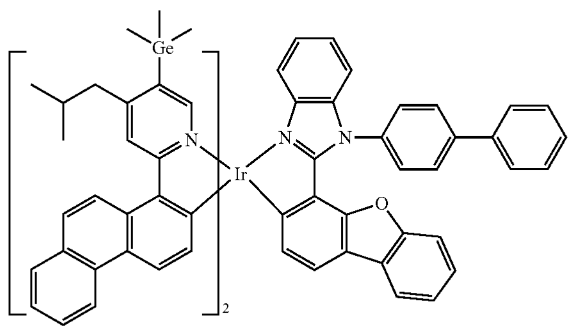
960
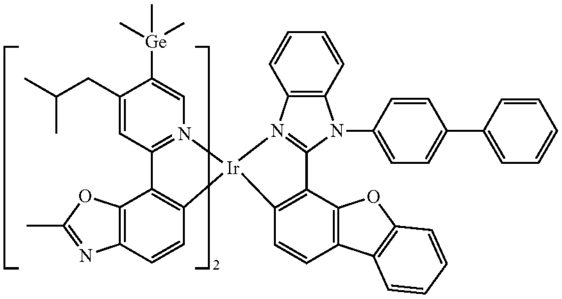
961
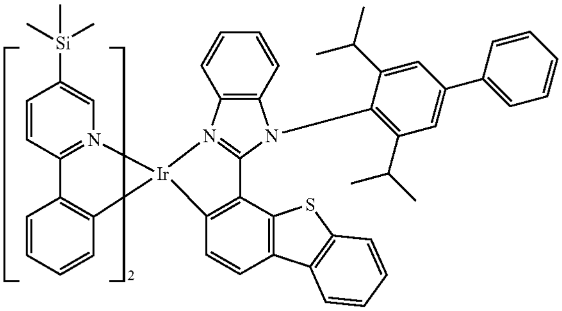
962
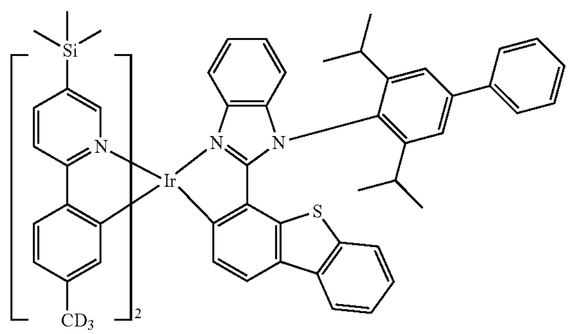
-continued
963
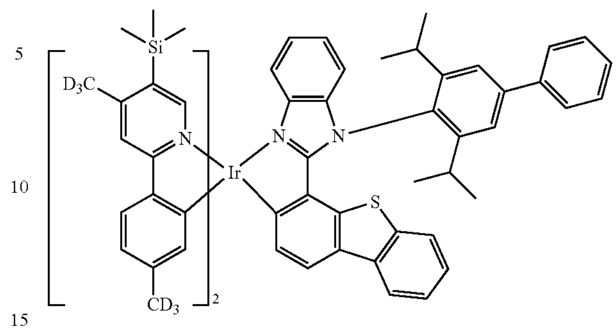
964
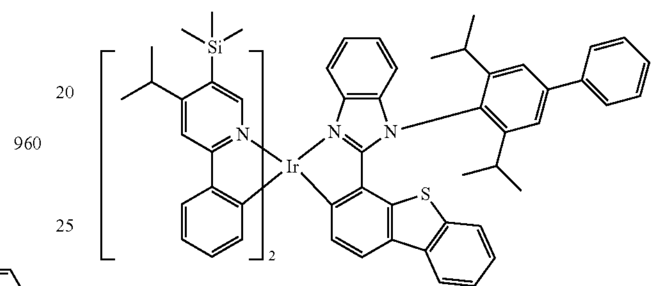
965
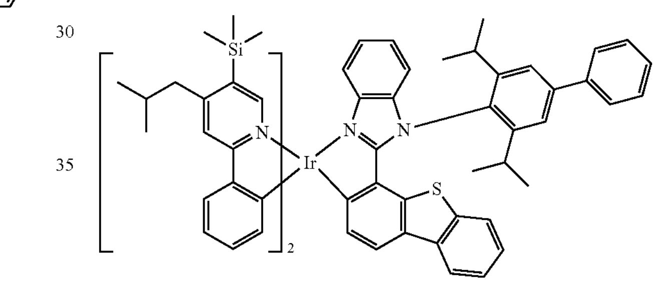
966
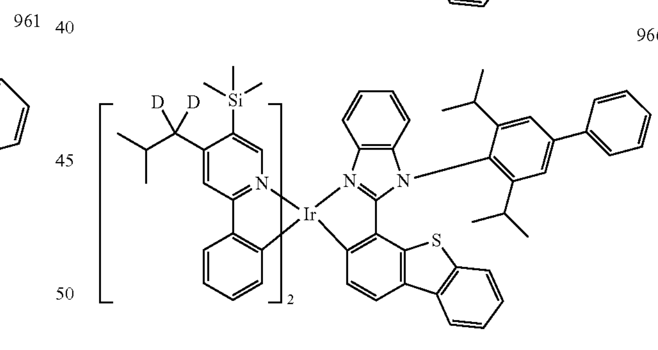
967
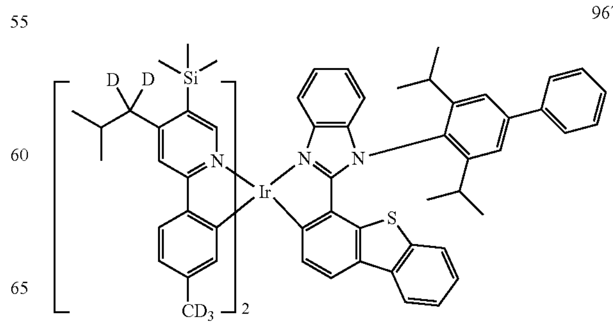

-continued
968
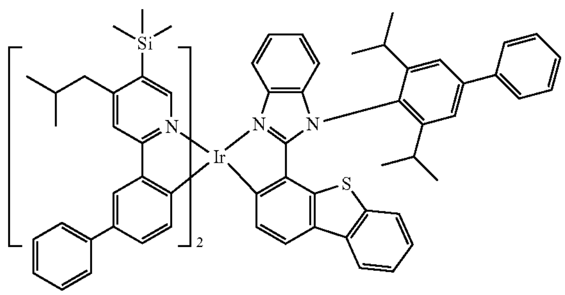
969
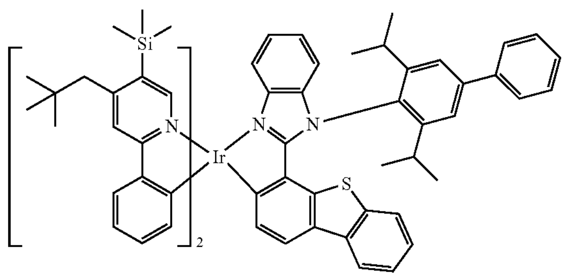
970
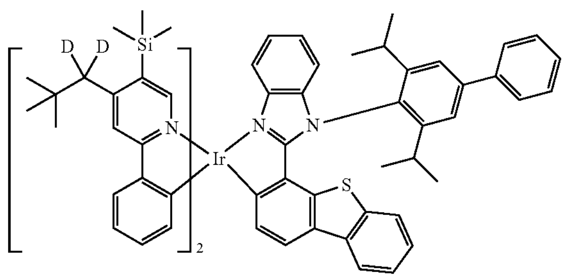
971
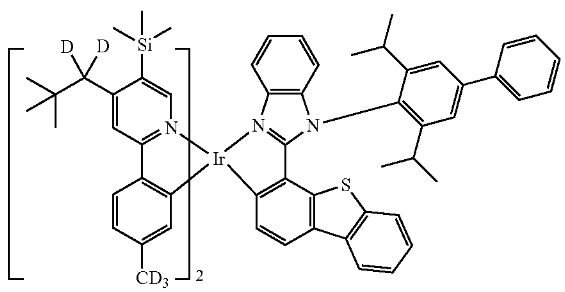
972
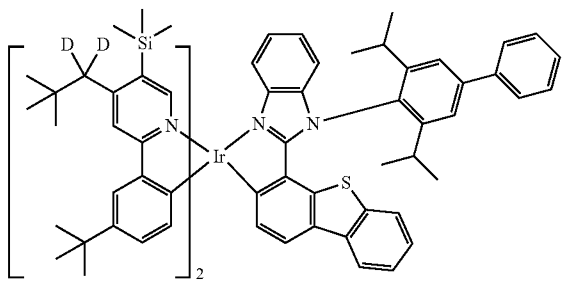
-continued
973
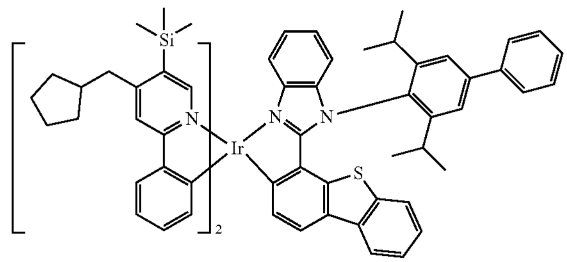
974
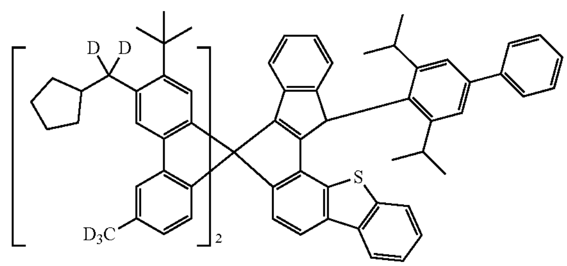
975
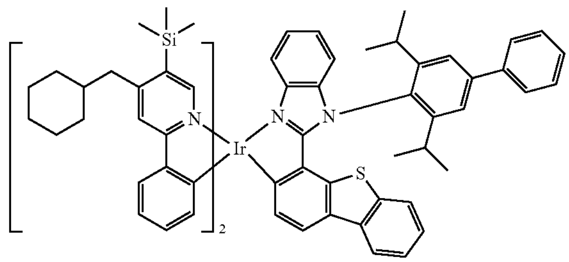
976
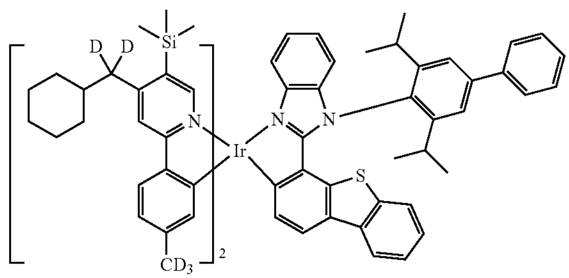
977
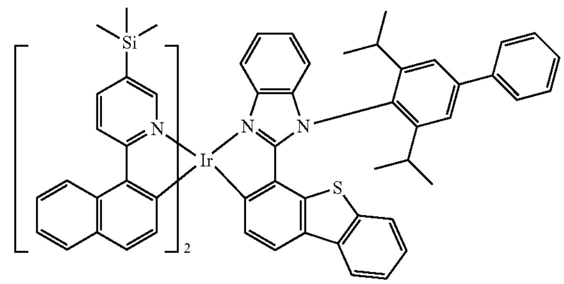

-continued
978
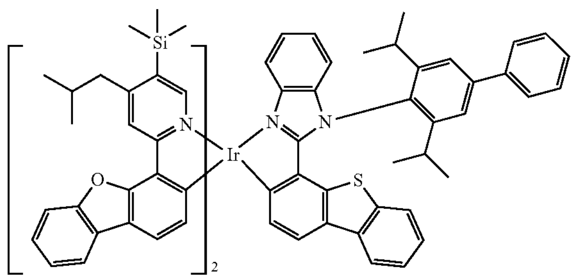
979
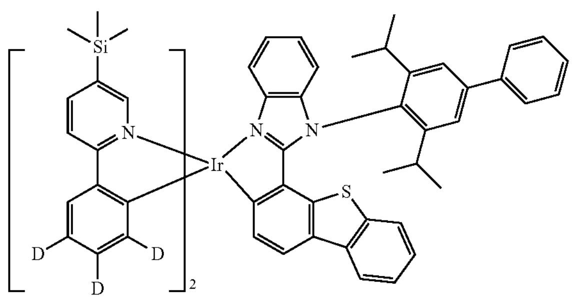
980
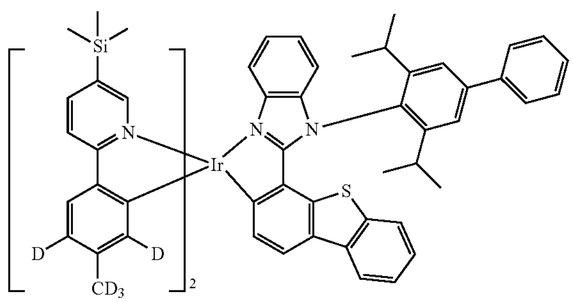
981
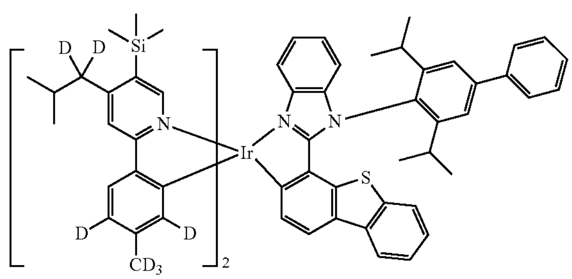
982
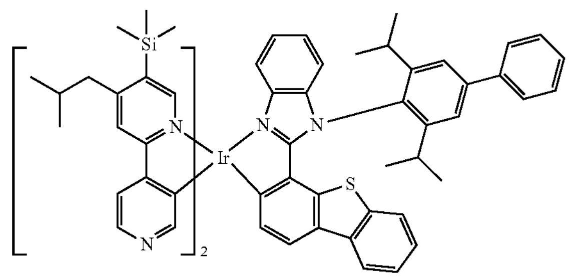
-continued
983
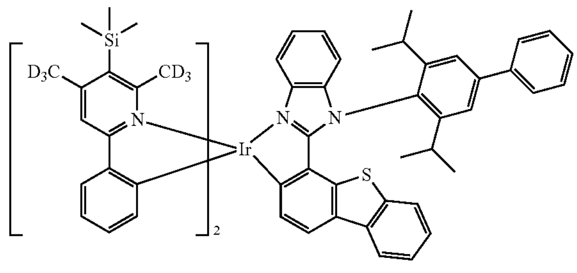
984
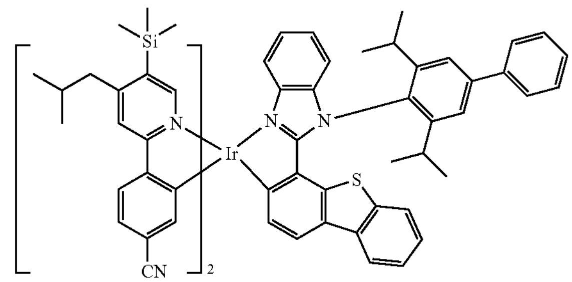
985
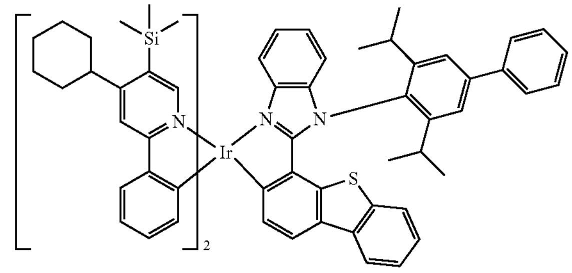
986
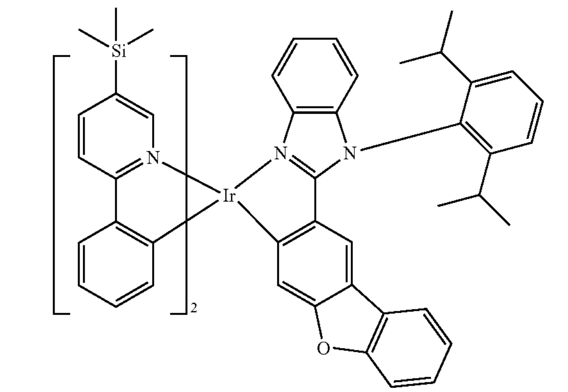

-continued
987
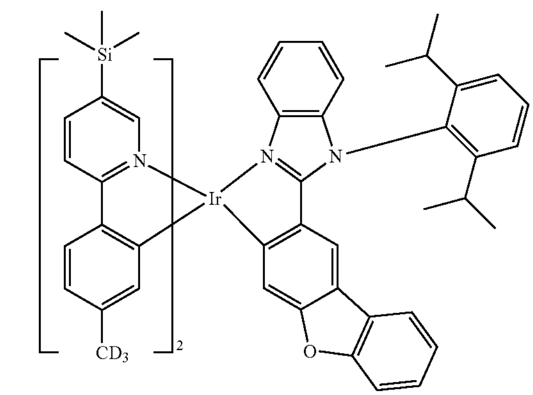
988
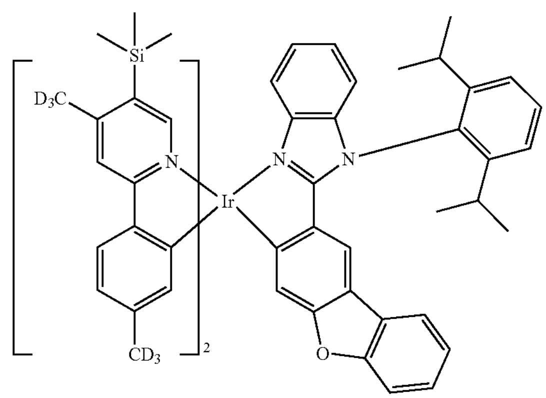
989
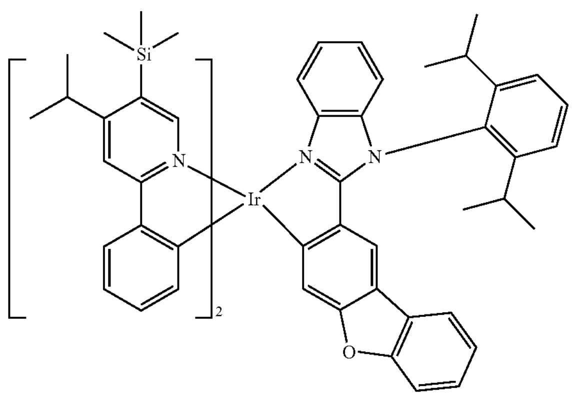
990
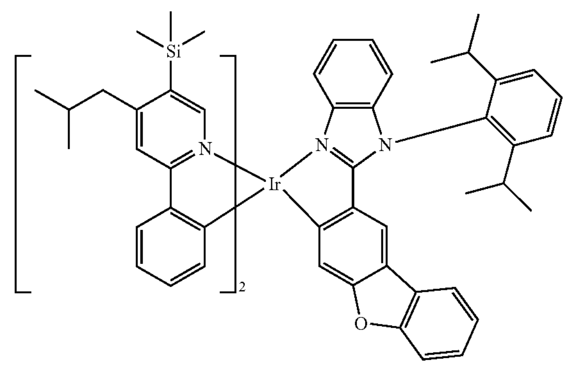
-continued
991
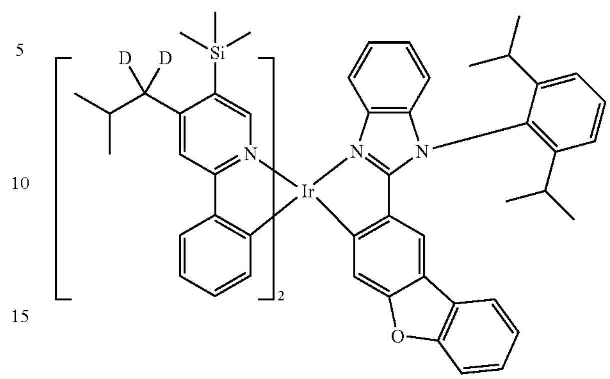
992
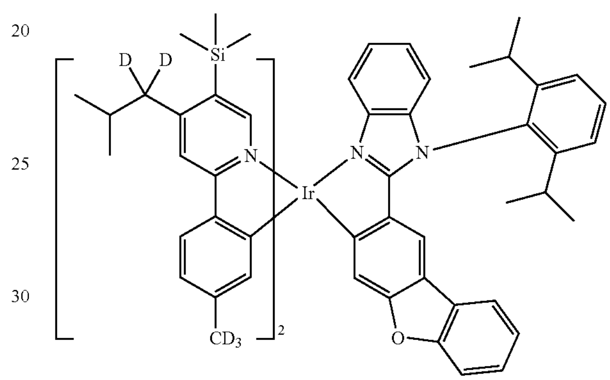
993
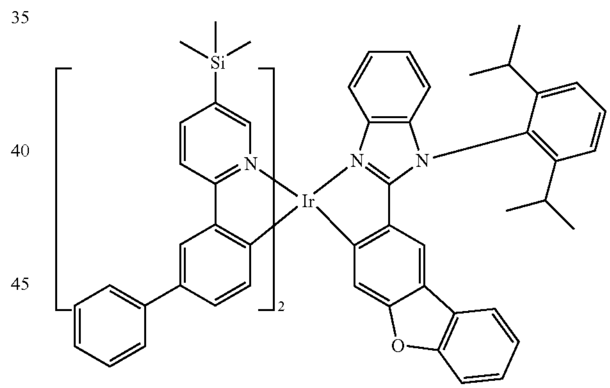
994
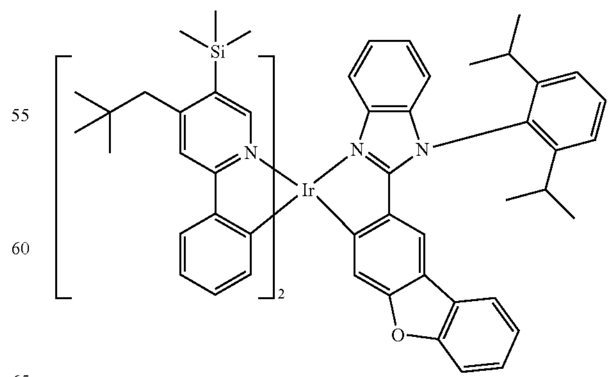

-continued
995
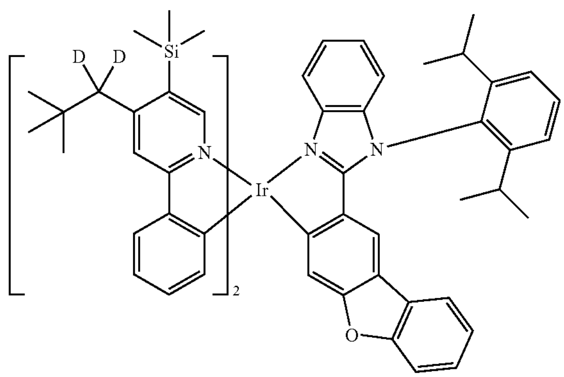
996
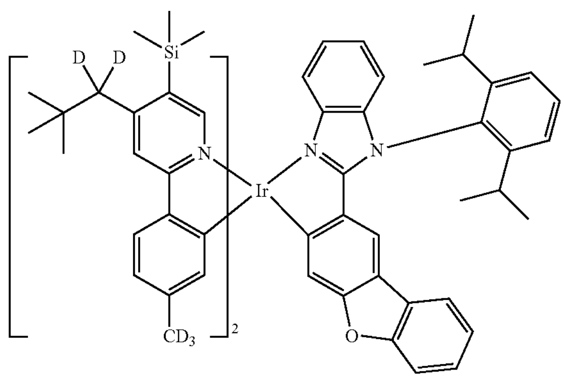
997
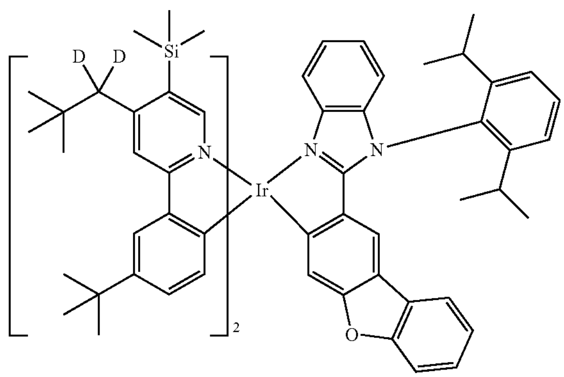
998
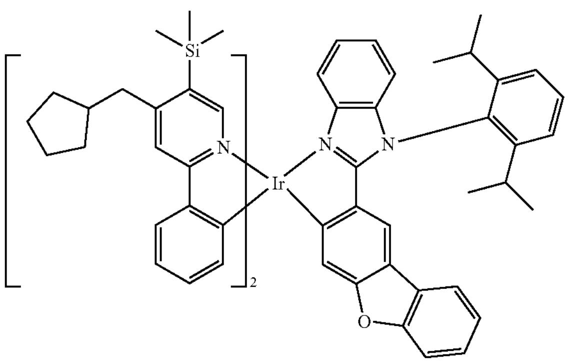
-continued
999
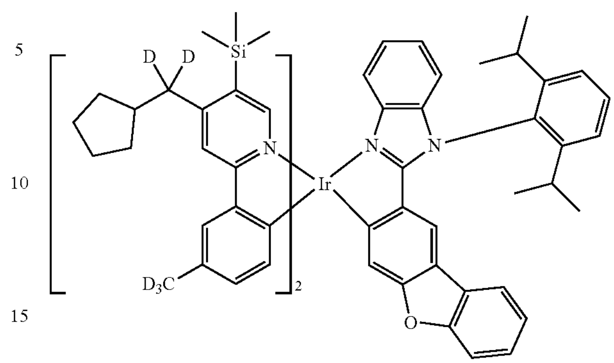
1000
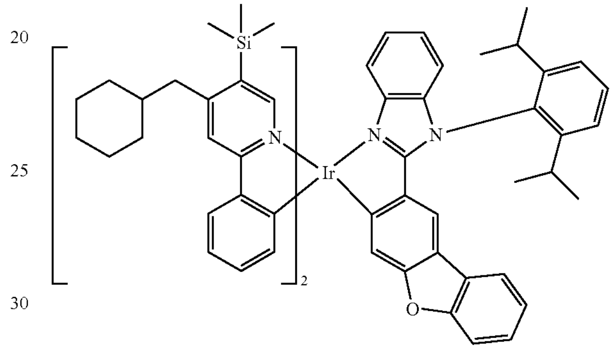
1001
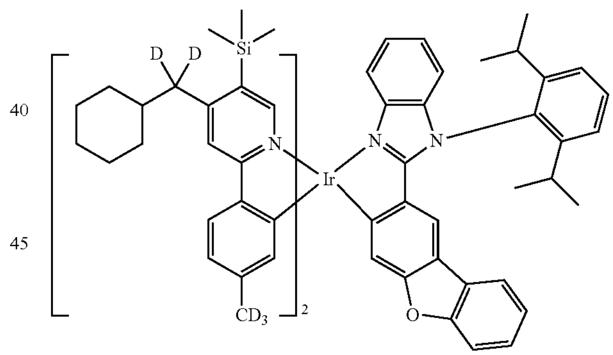
1002
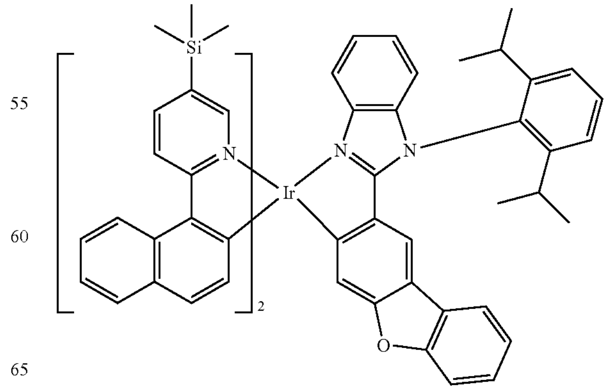

1003
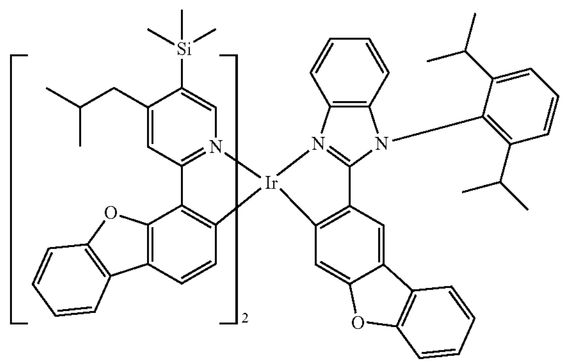
1004
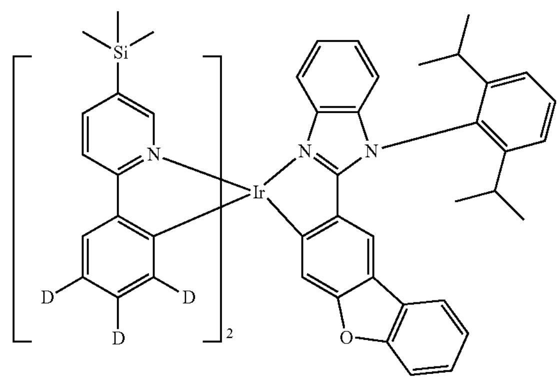
1005
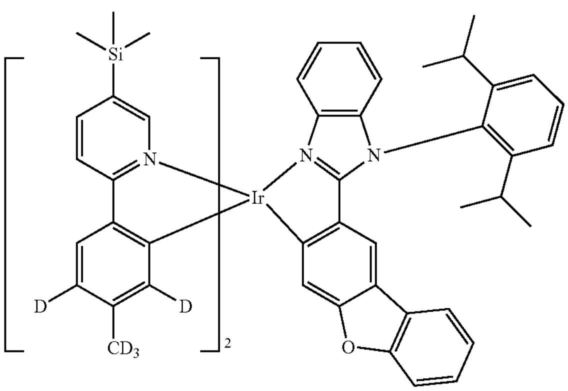
1006
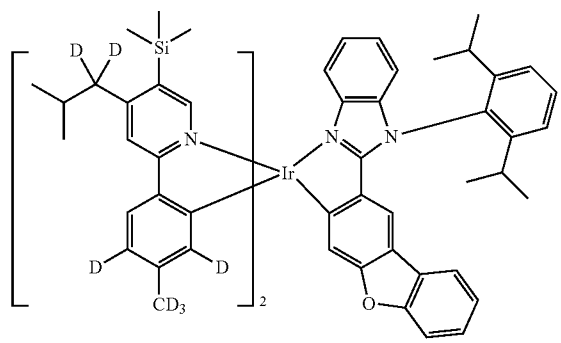
1007
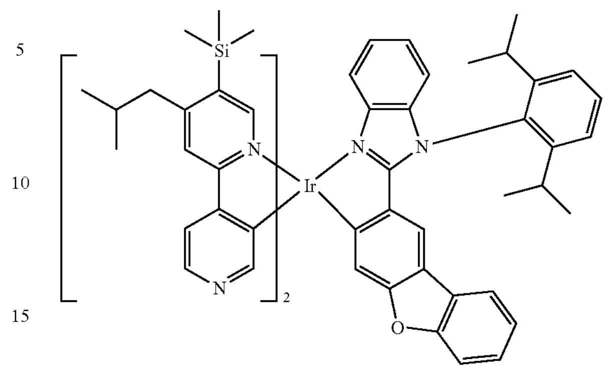
1008
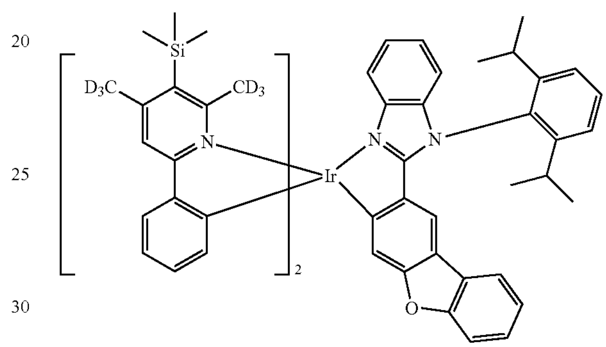
1009
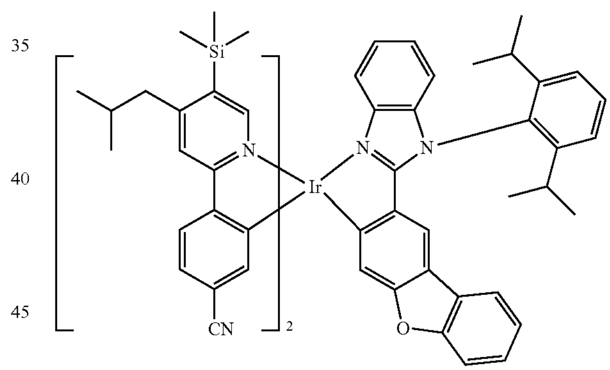
1010
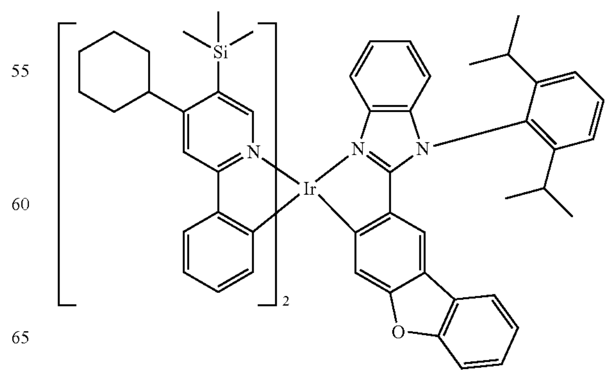

1011
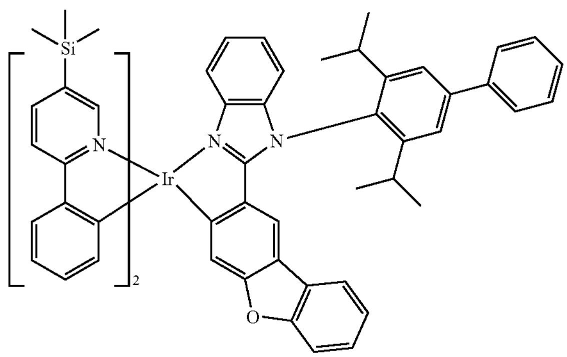
1012
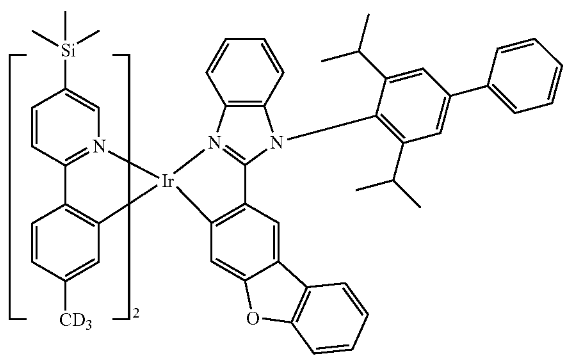
1013
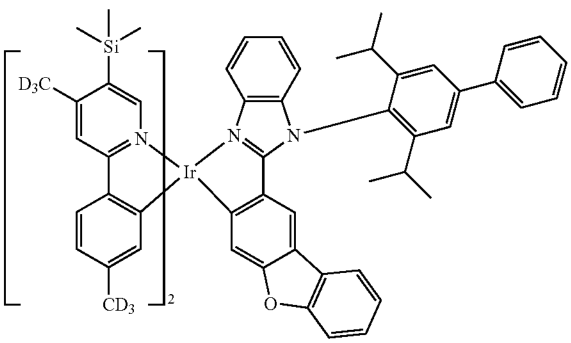
1014
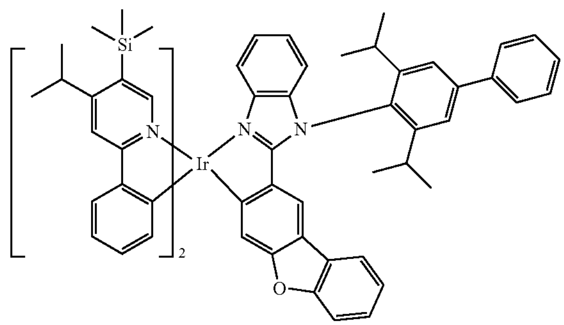
1015
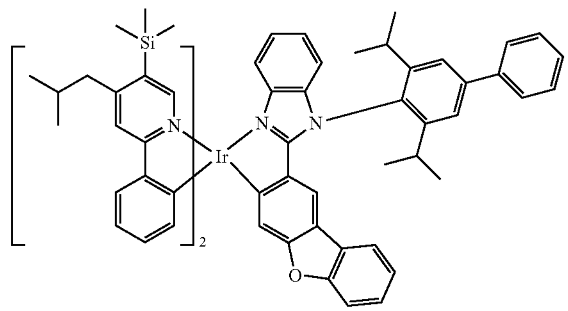
1016
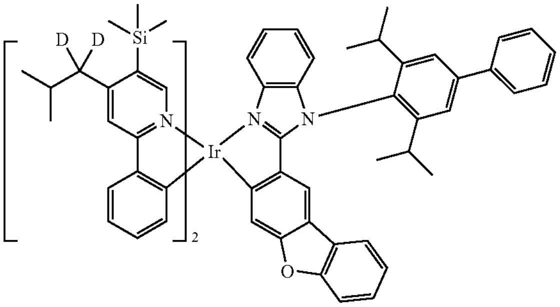
1017
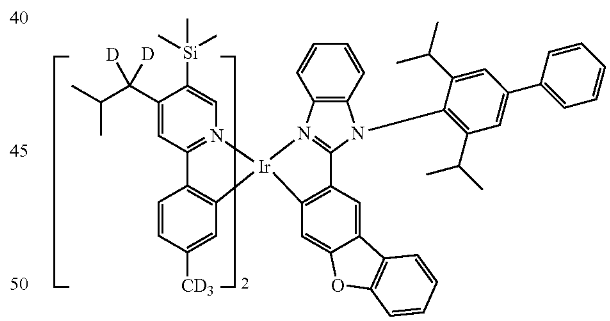
1018
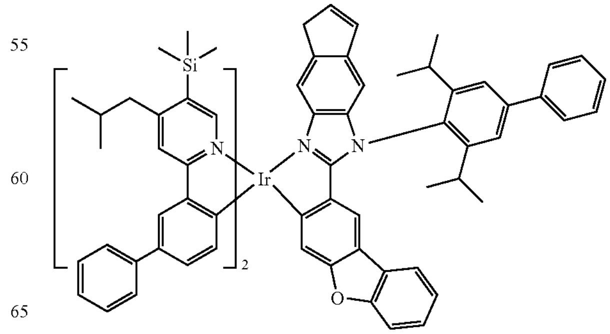

-continued
1019
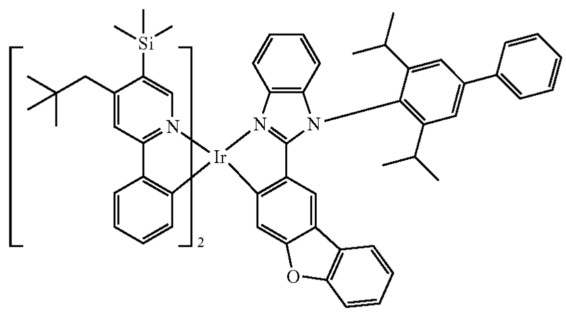
1020
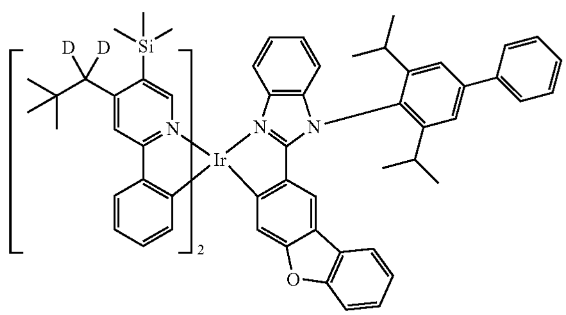
1021
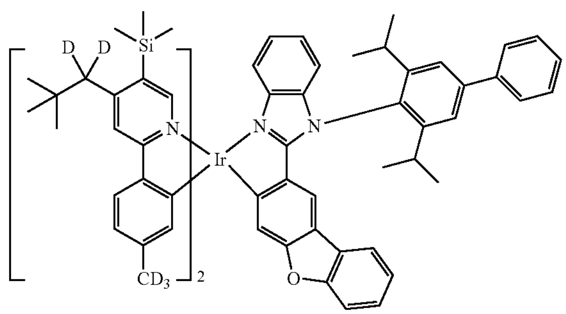
1022
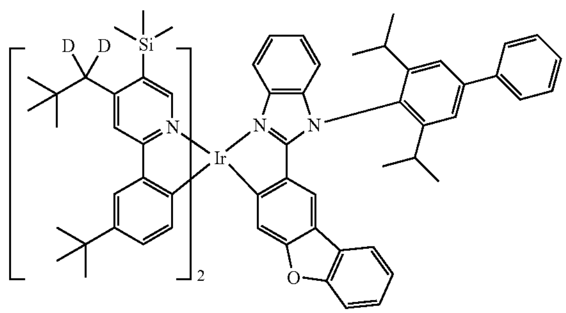
1023
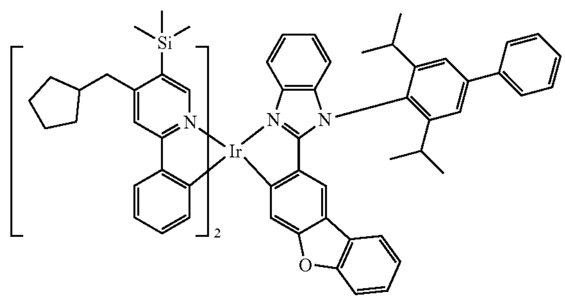
-continued
1024
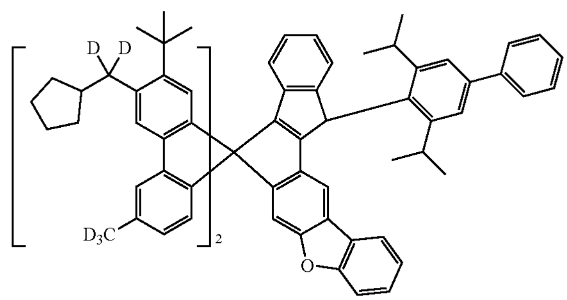
1025
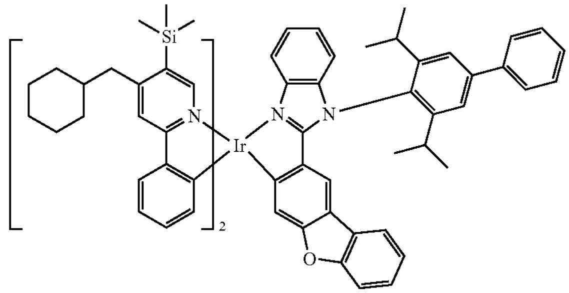
1026
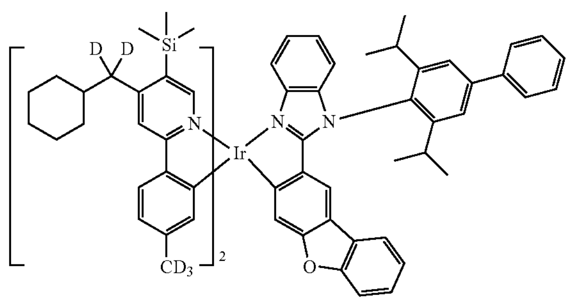
1027
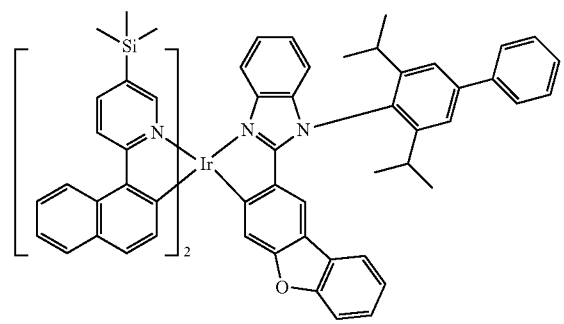
1028
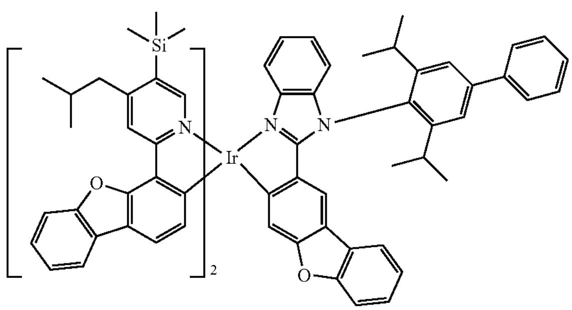

-continued
1029
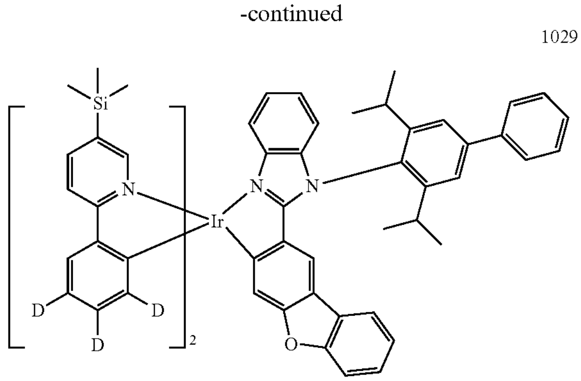
1030
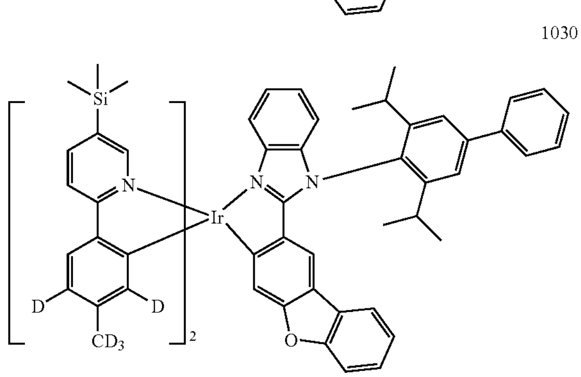
1031
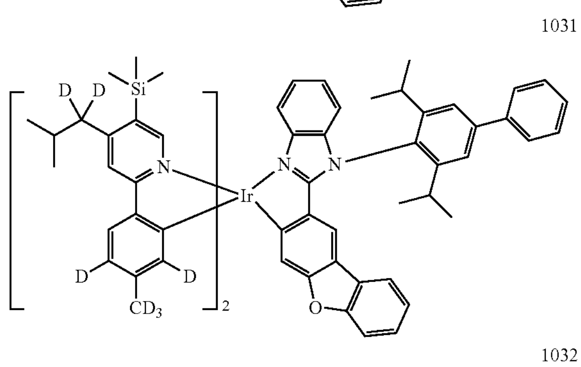
1032
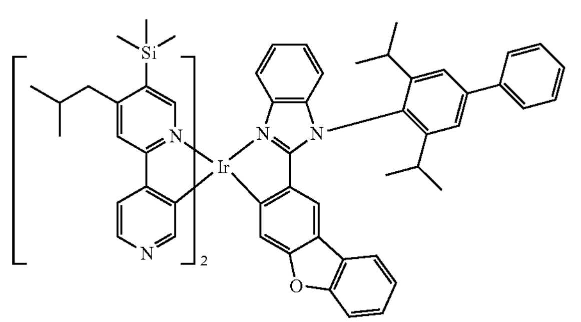
1033
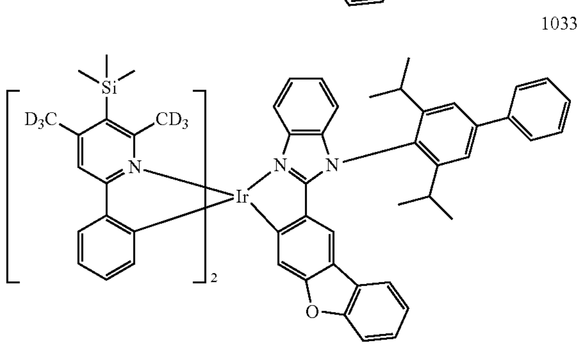
-continued
1034
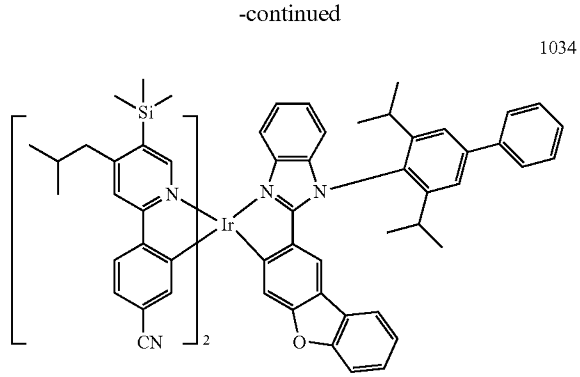
1035
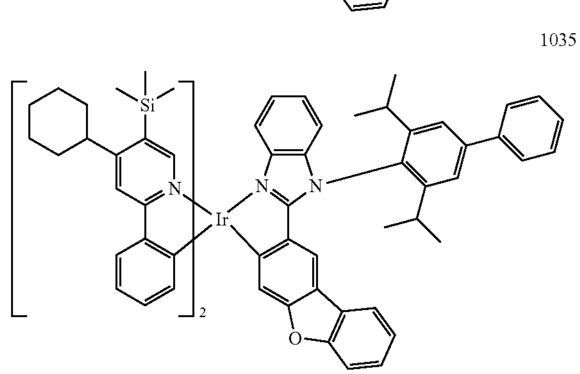
1036
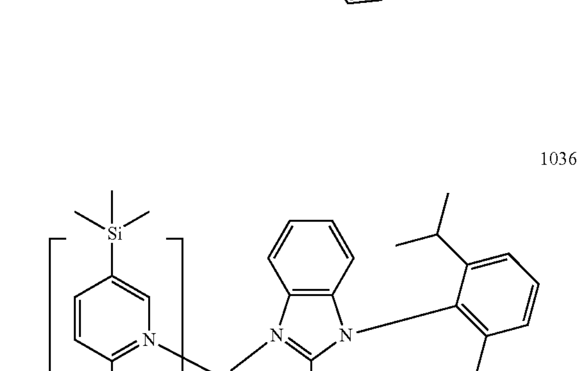
1037
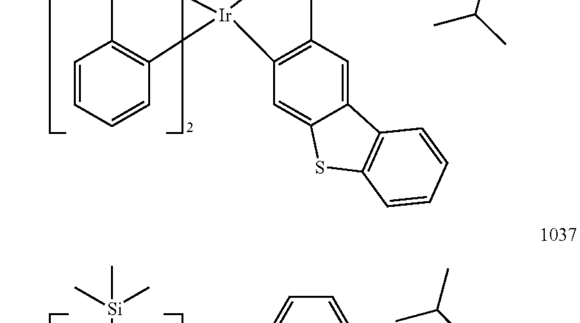
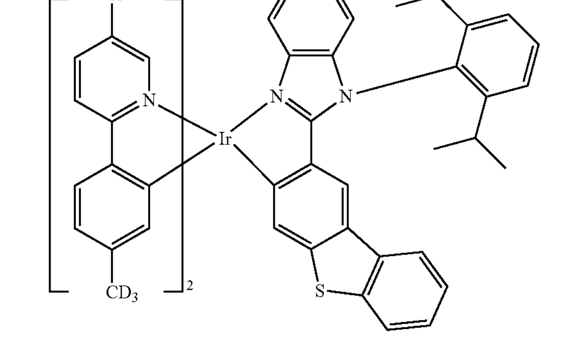

1038
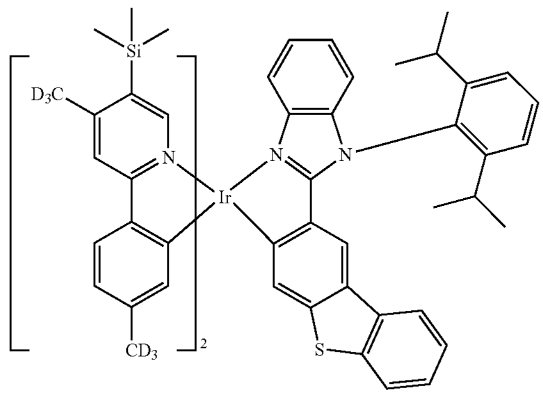
1039
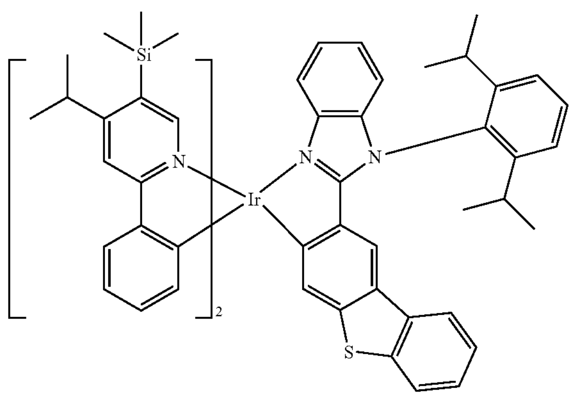
1040
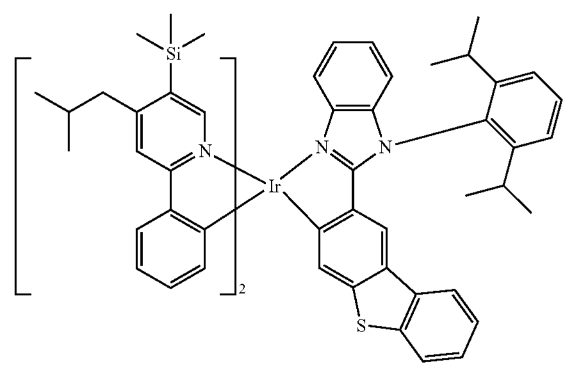
1041
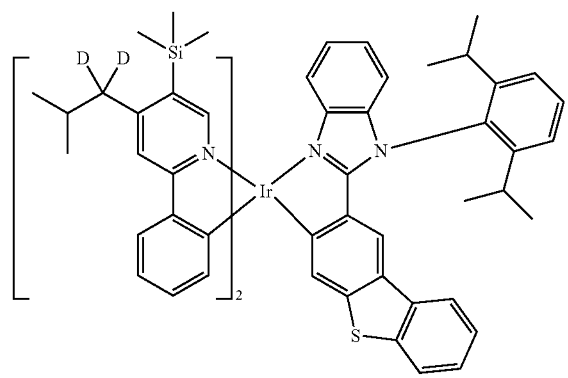
1042
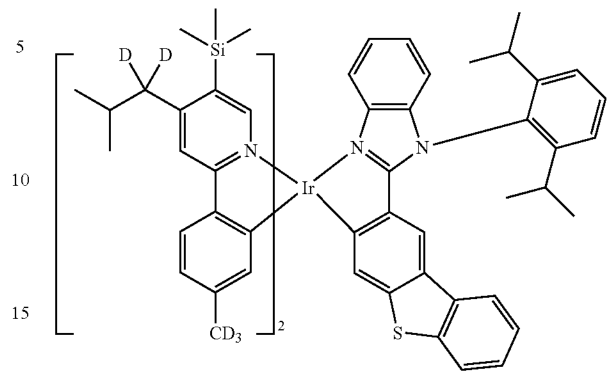
1043
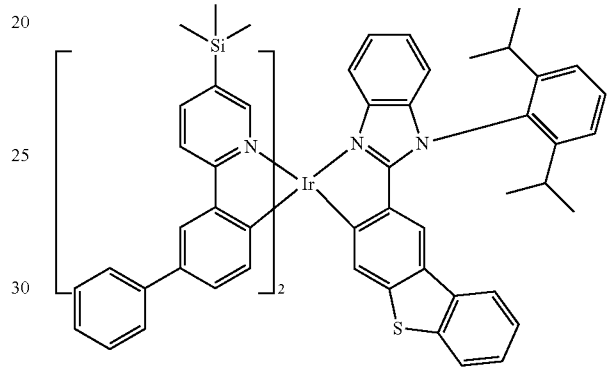
1044
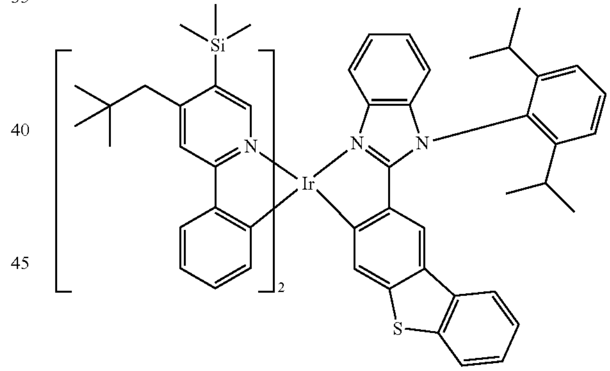
1045
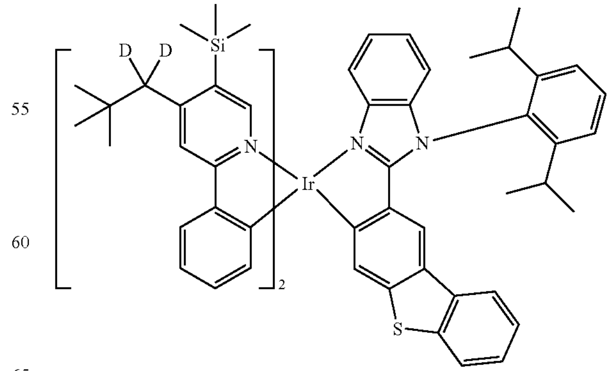

-continued
1046
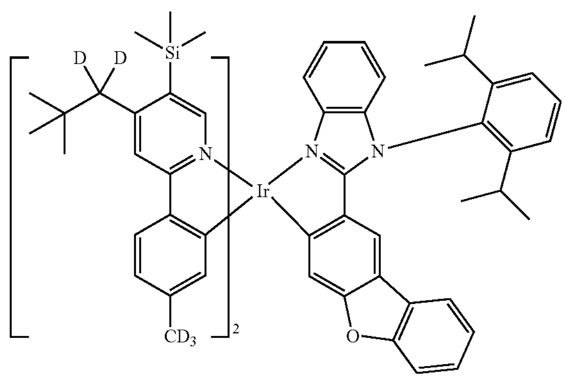
1047
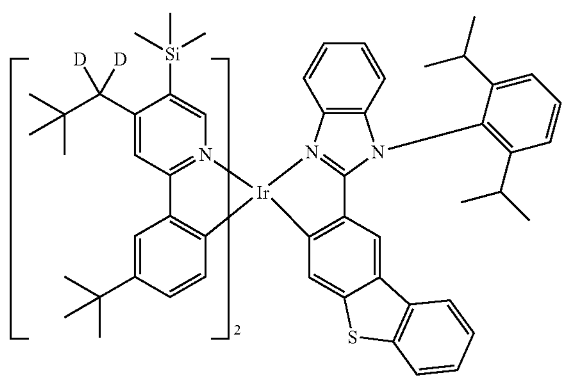
1048
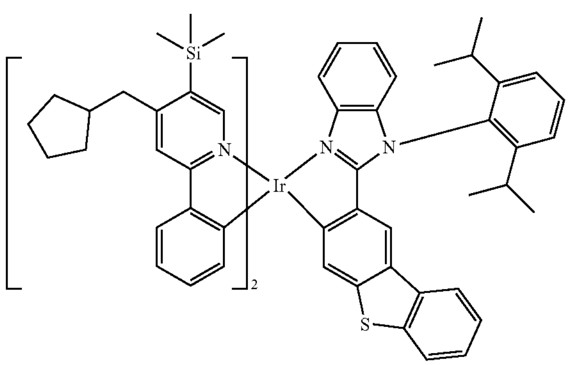
1049
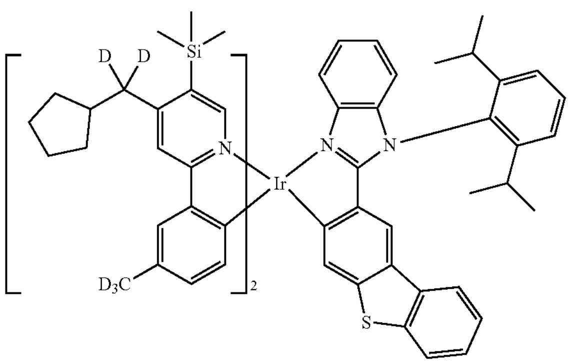
-continued
1050
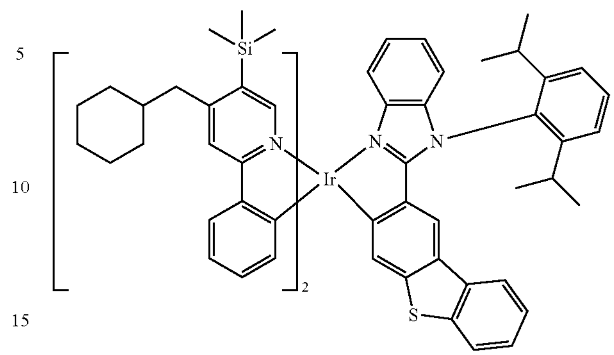
1051
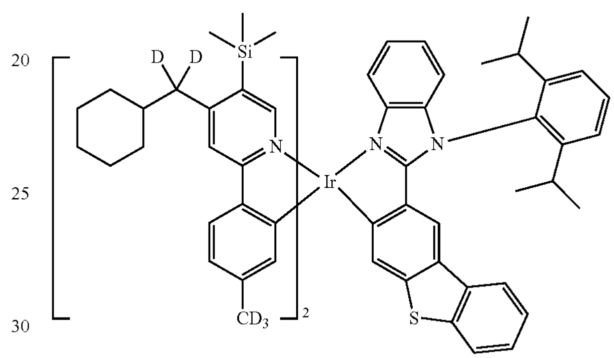
1052
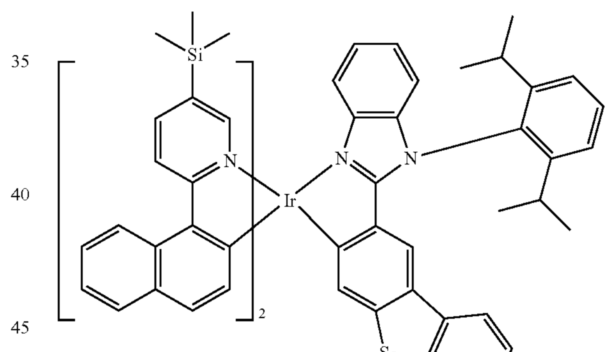
1053
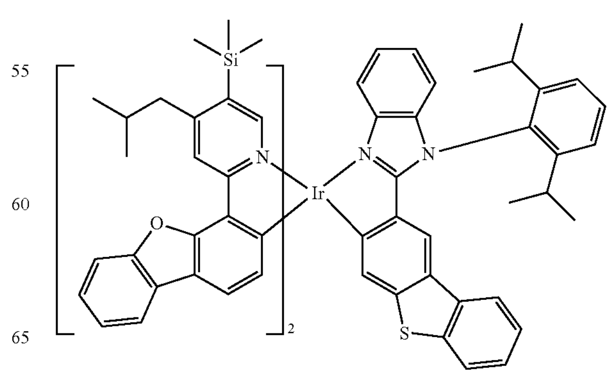

-continued
1054
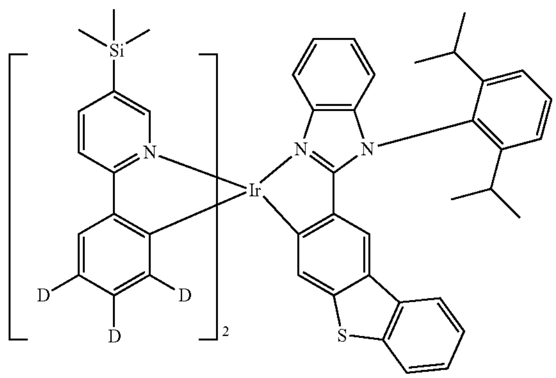
1055
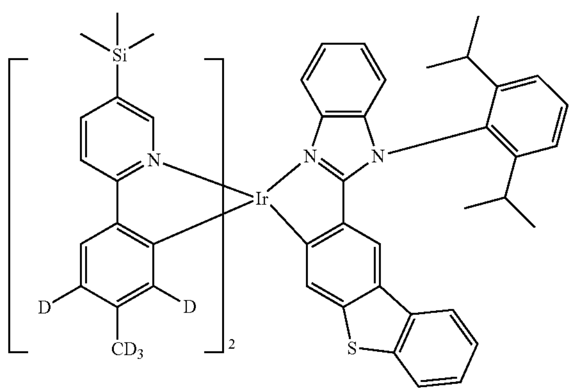
1056
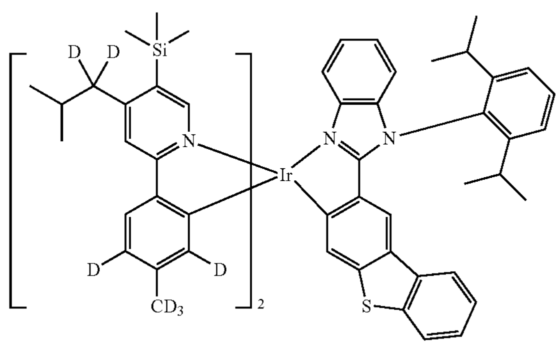
1057
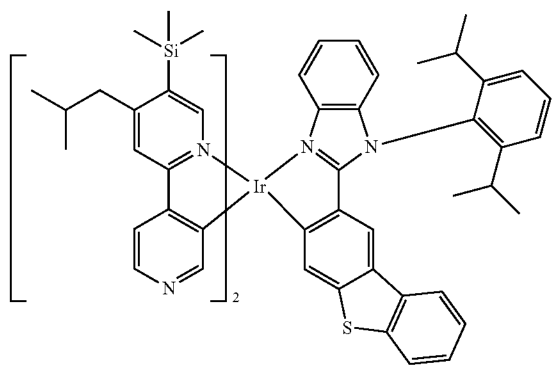
-continued
1058
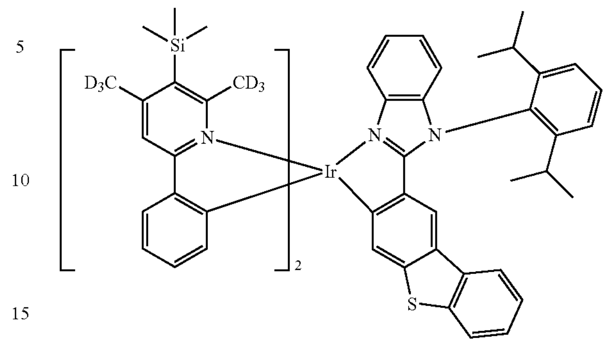
1059
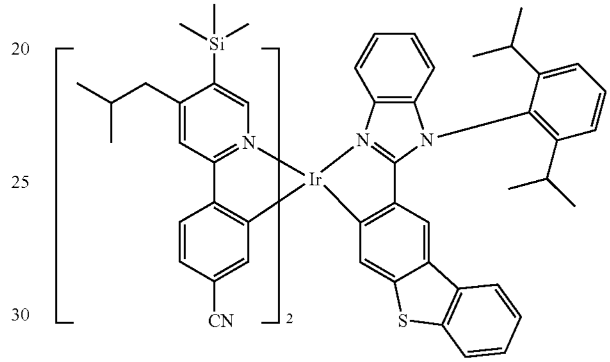
1060
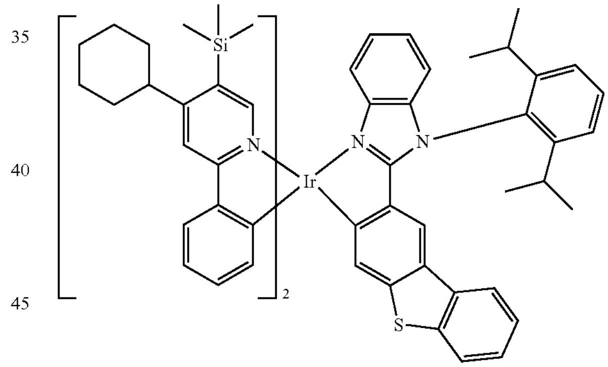
1061
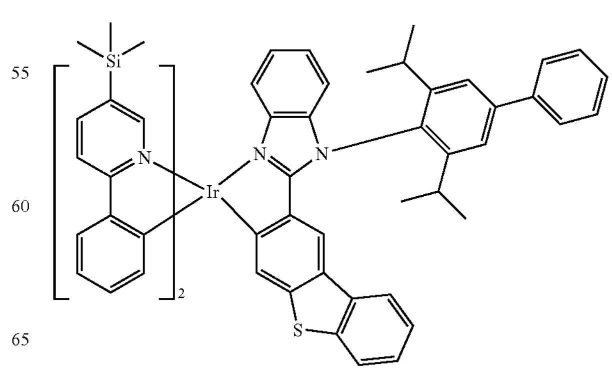

-continued
1062
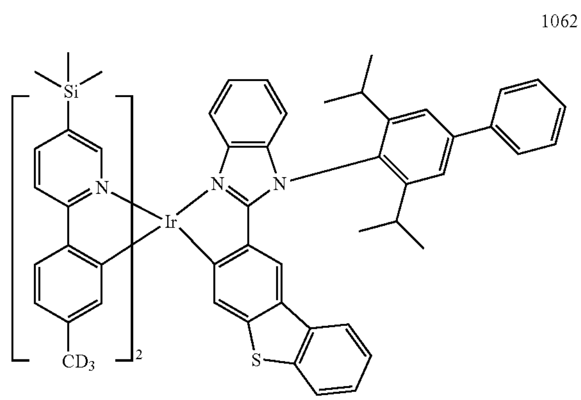
1063
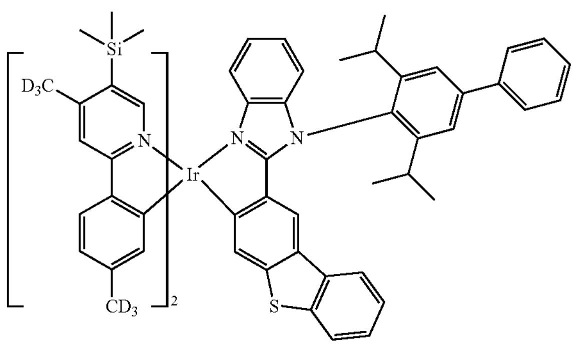
1064
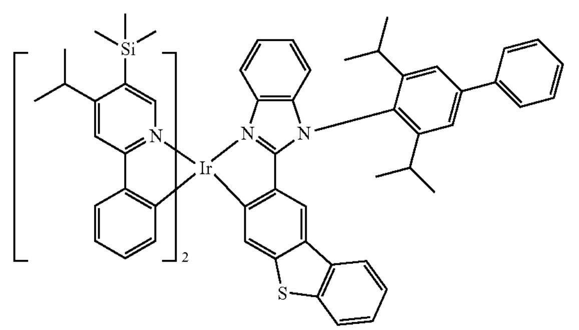
1065
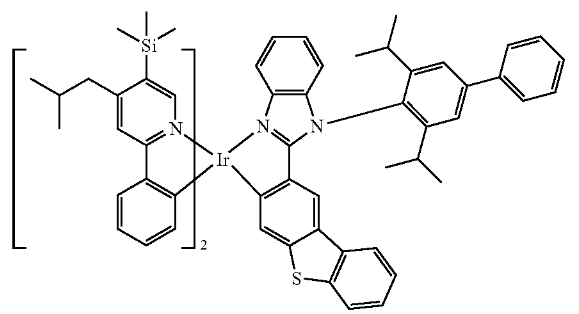
-continued
1066
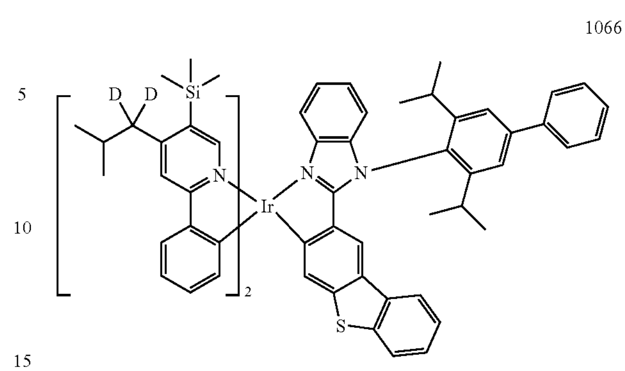
1067
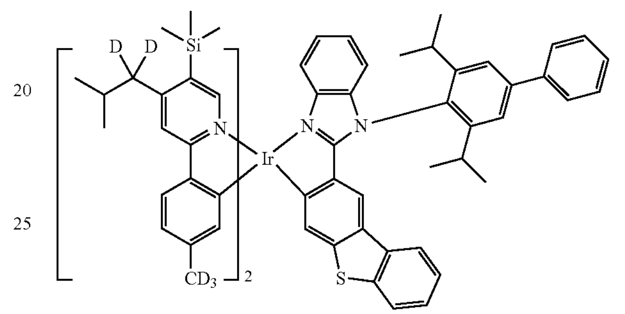
1068
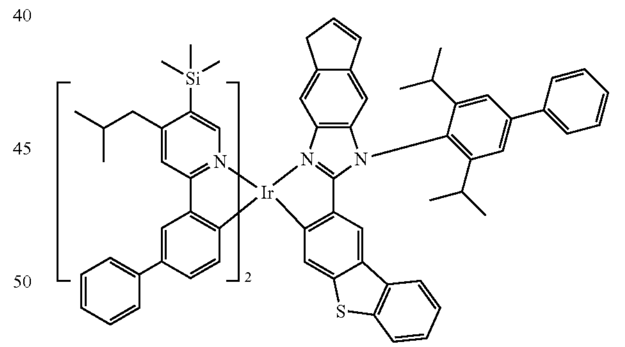
1069
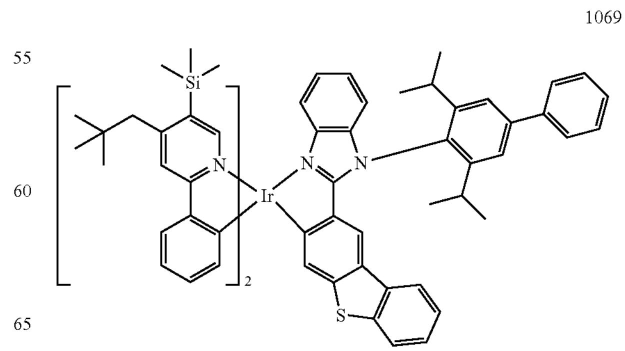

-continued
1070
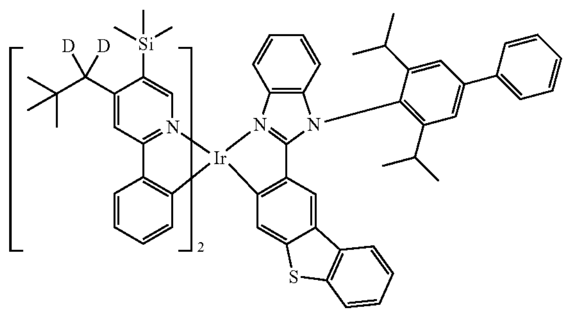
1071
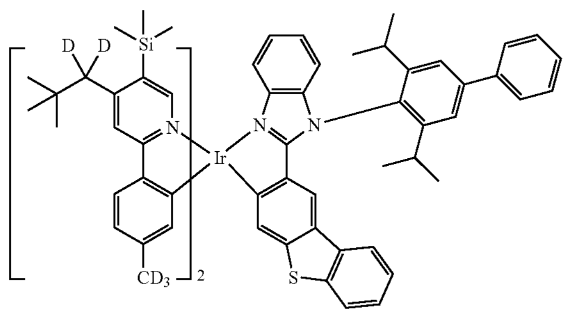
1072
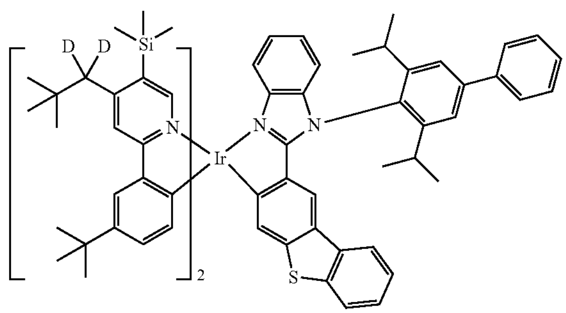
1073
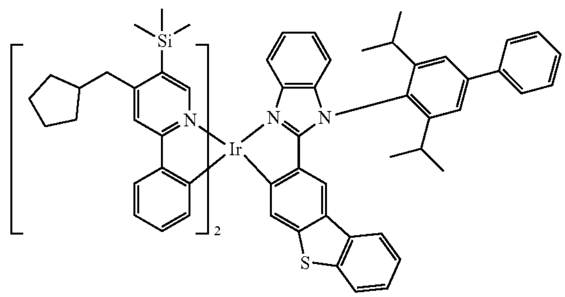
1074
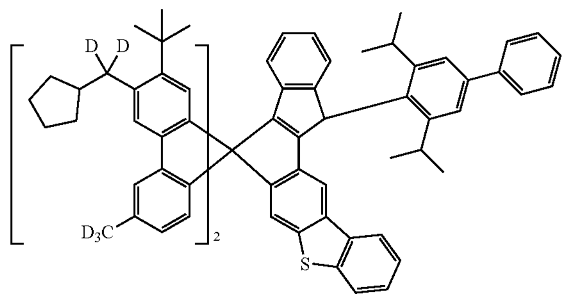
-continued
1075
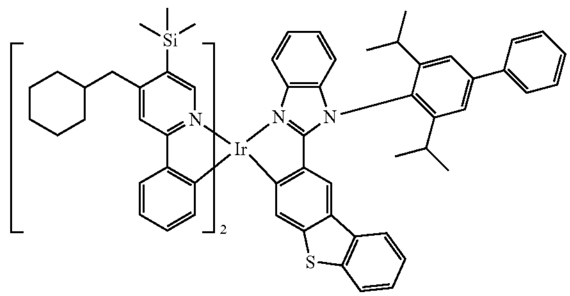
1076
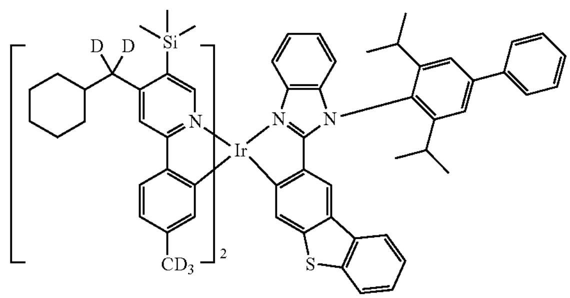
1077
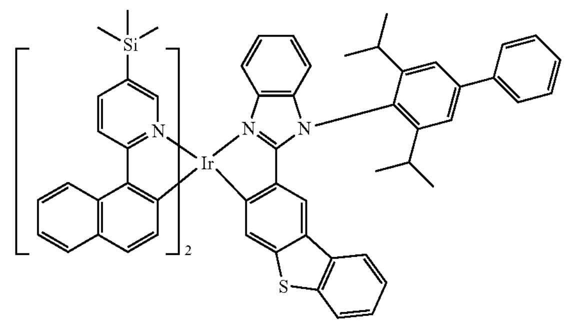
1078
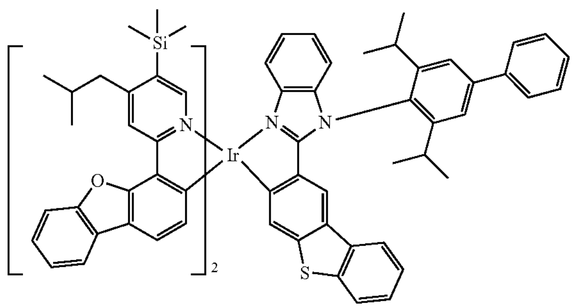
1079
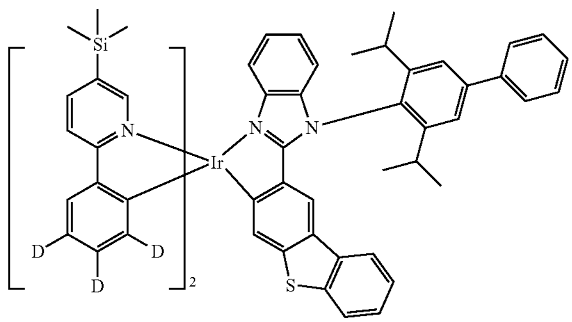

-continued
1080
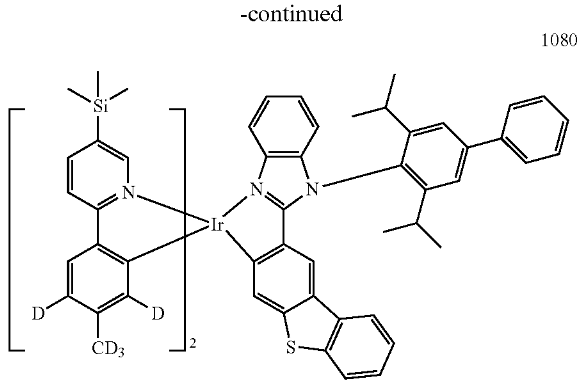
1081
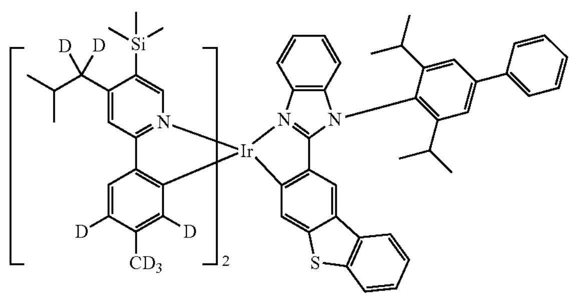
1082
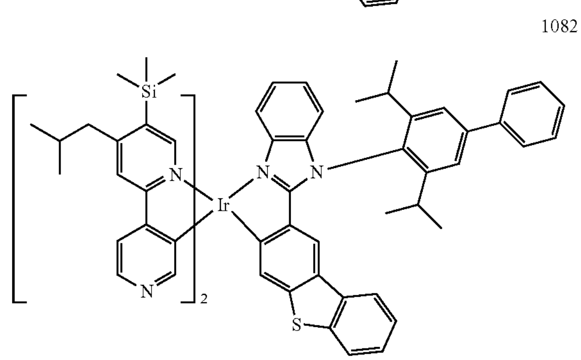
1083
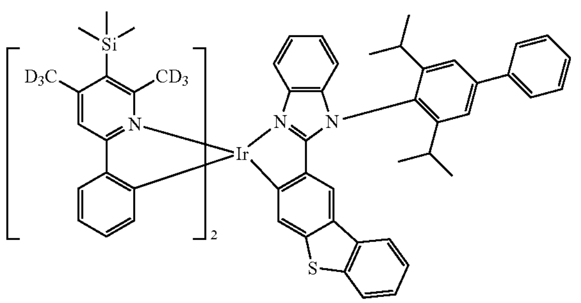
1084
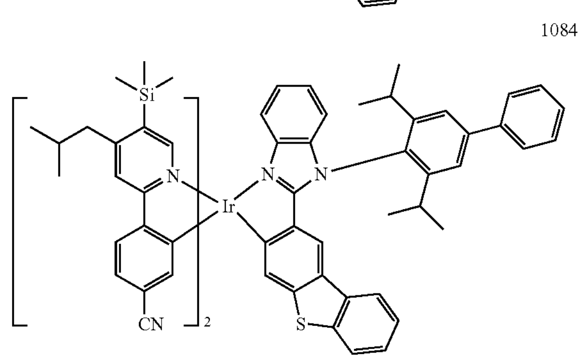
-continued
1085
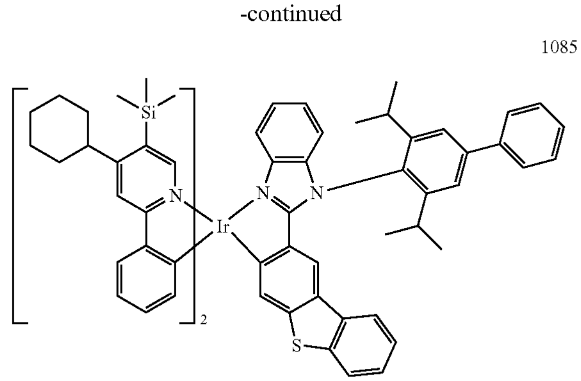
1086
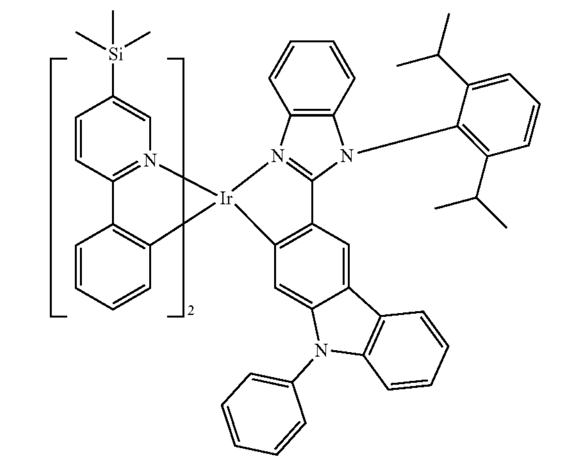
1087
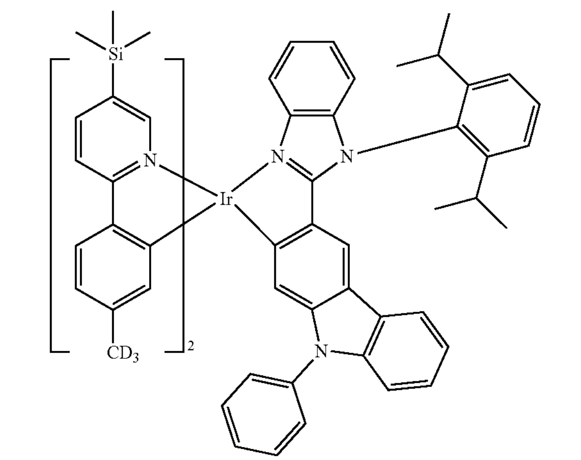

-continued
1088
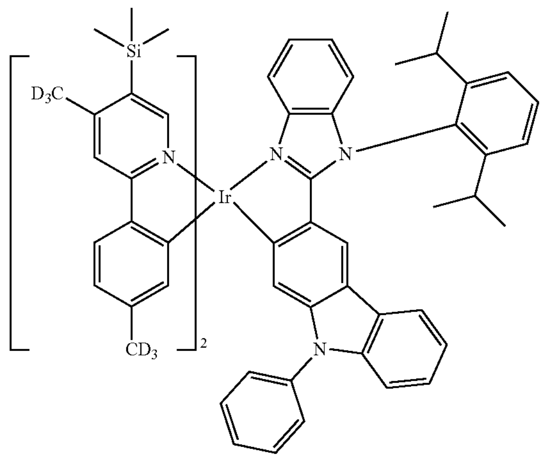
1089
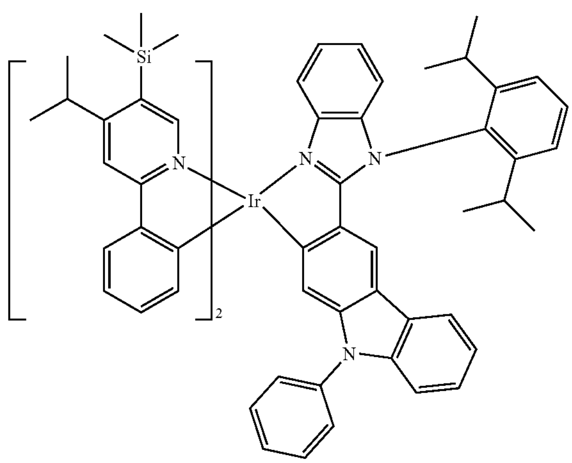
1090
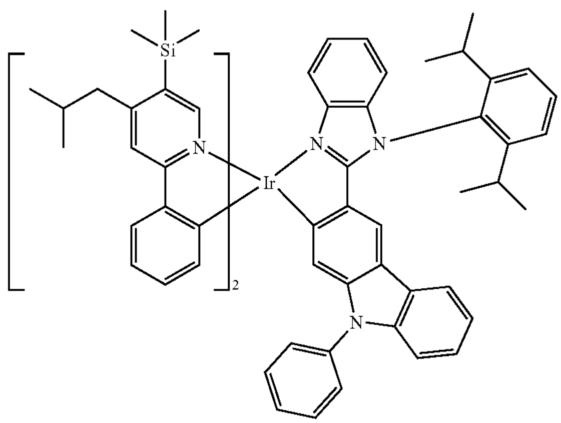
-continued
1091
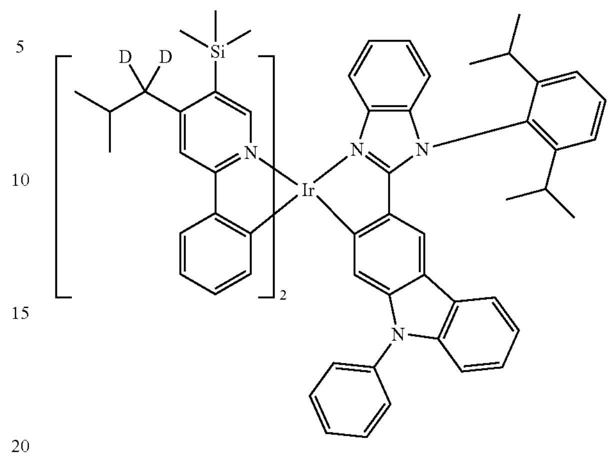
1092
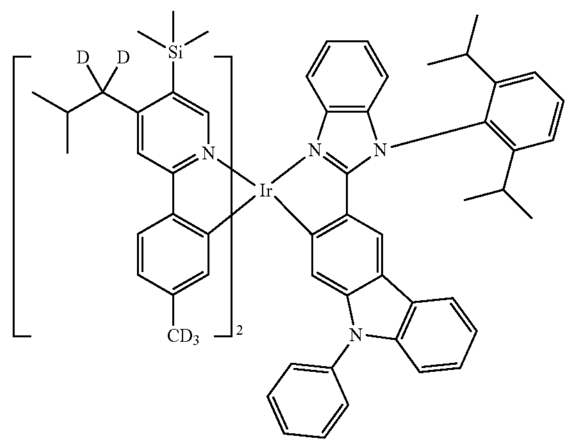
1093
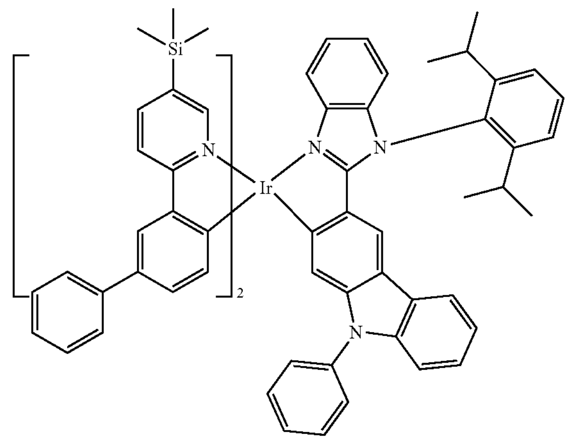

1094
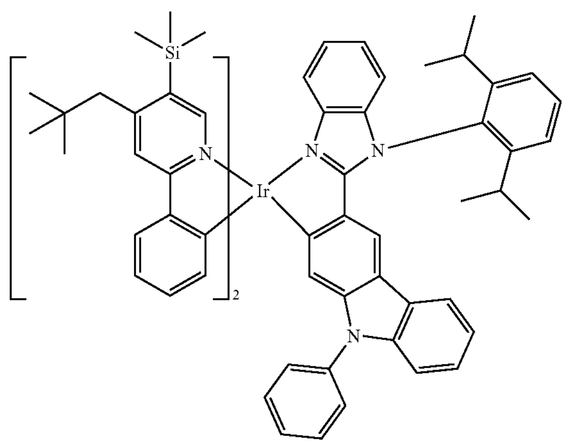
1097
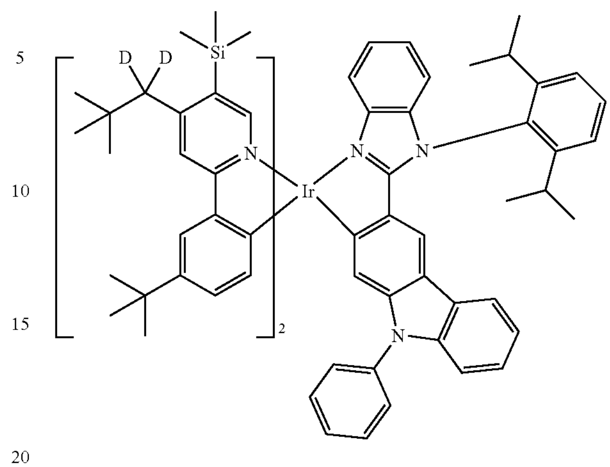
1098
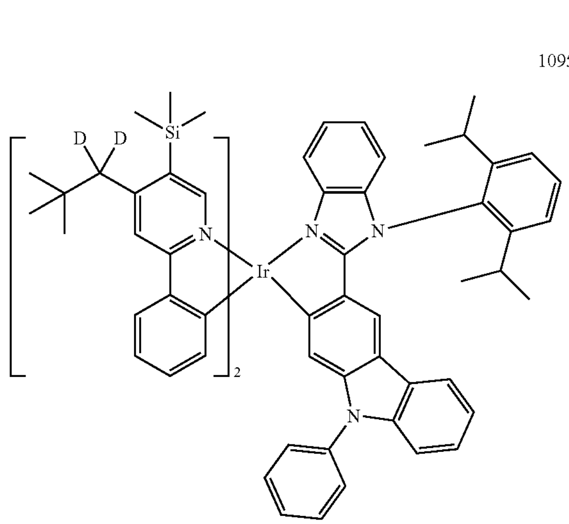
1095
1096
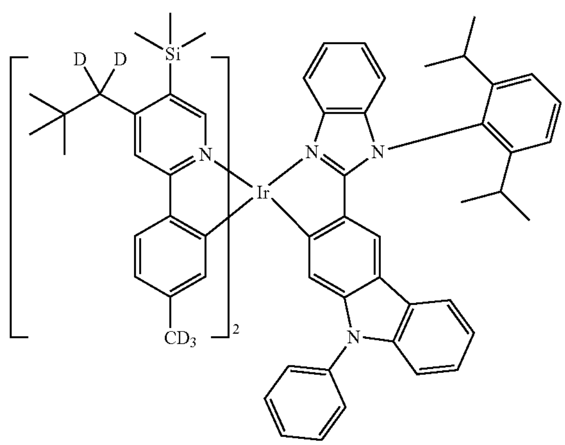
1099
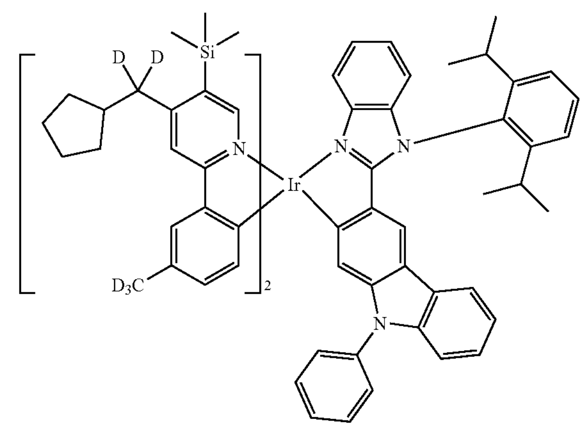

-continued
1100
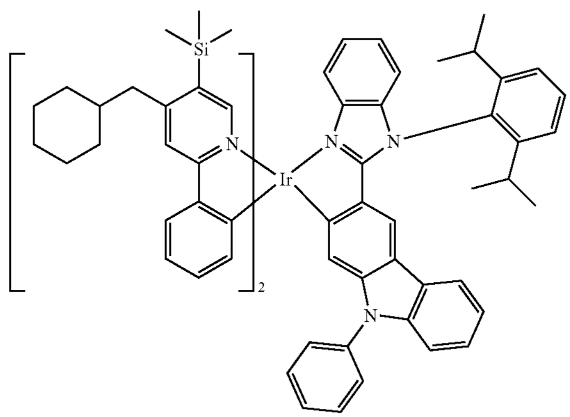
1101
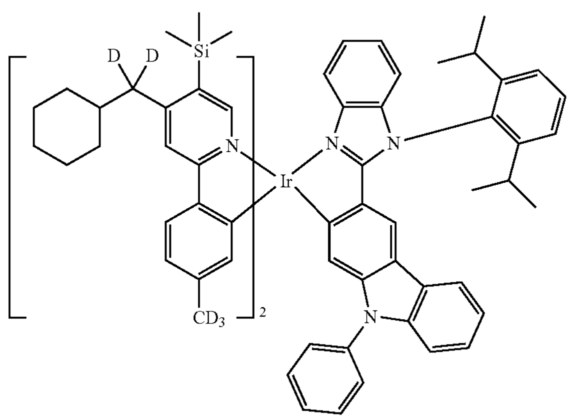
1102
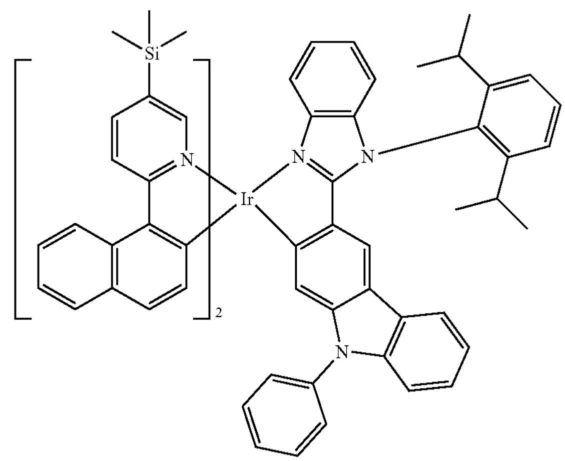
-continued
1103
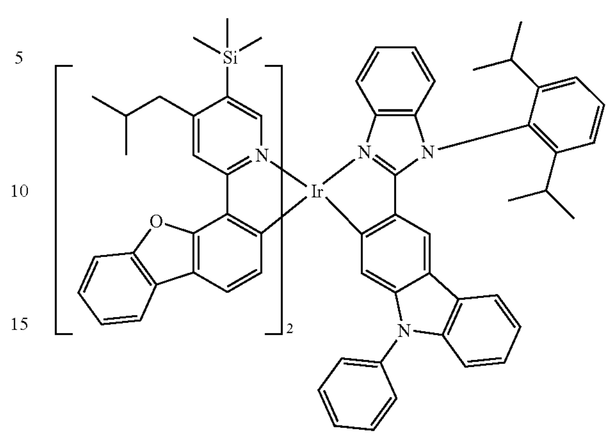
1104
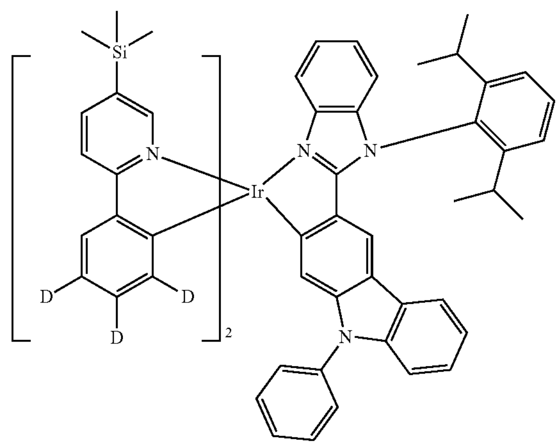
1105
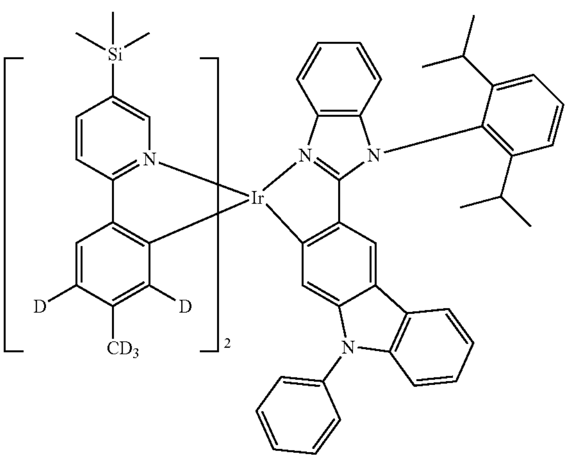

-continued
1106
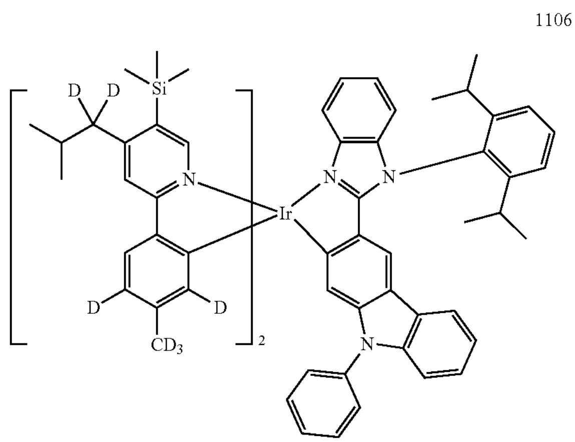
1107
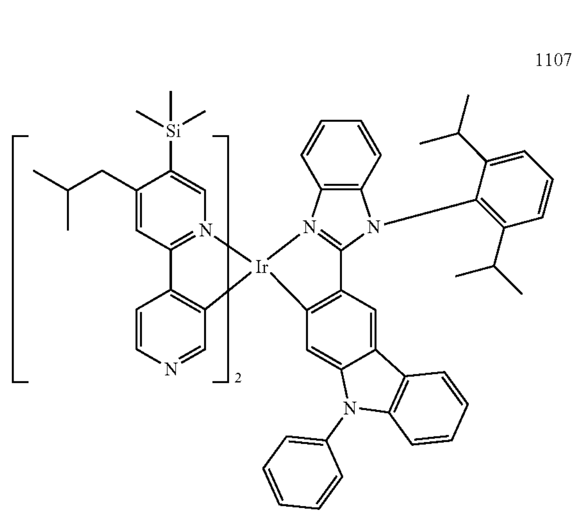
1108
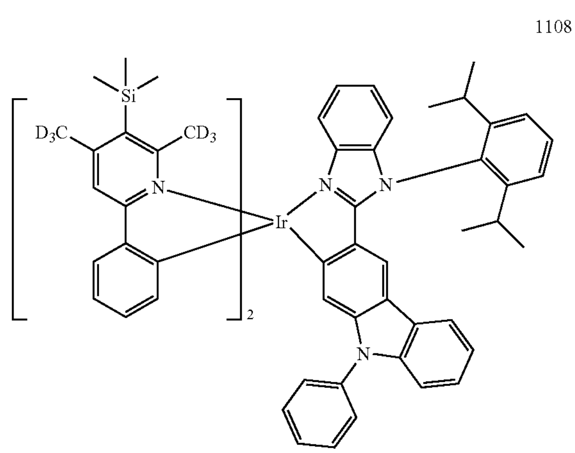
-continued
1109
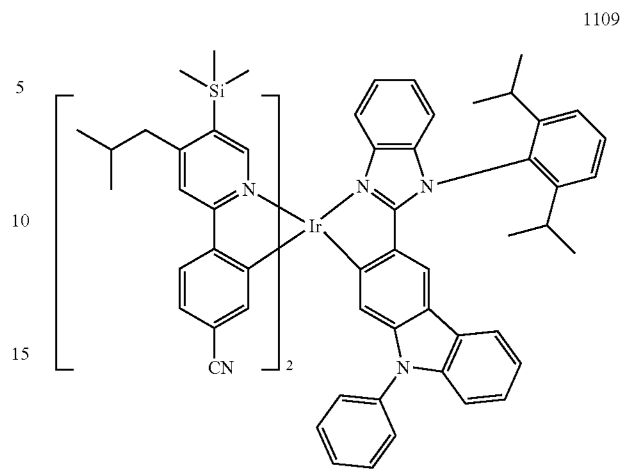
1110
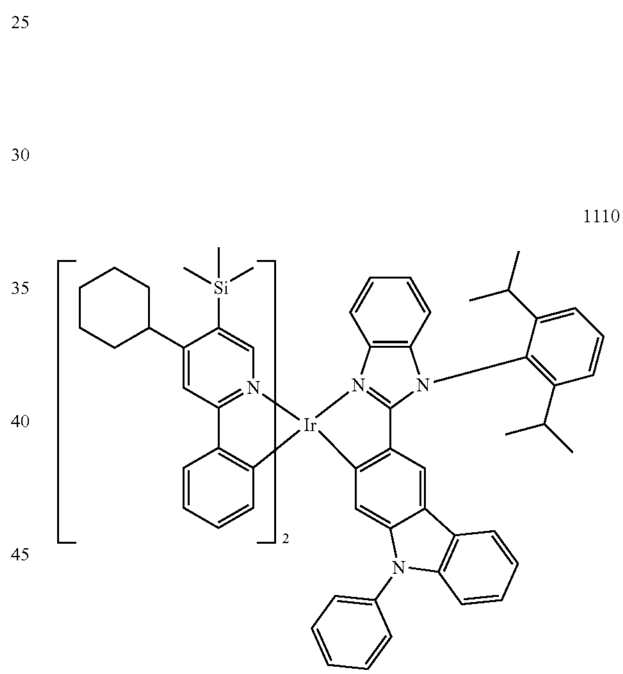
1111
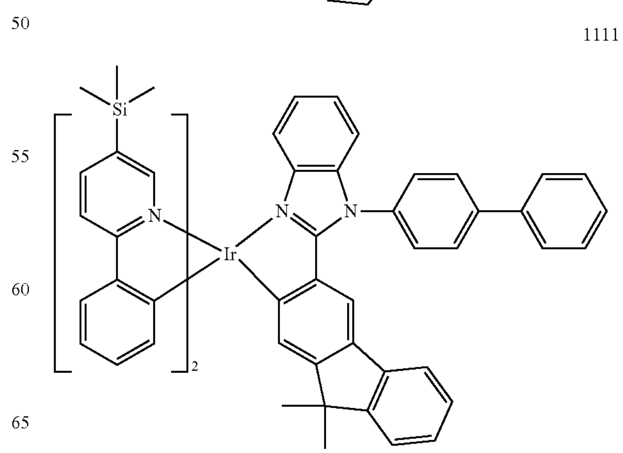

1112
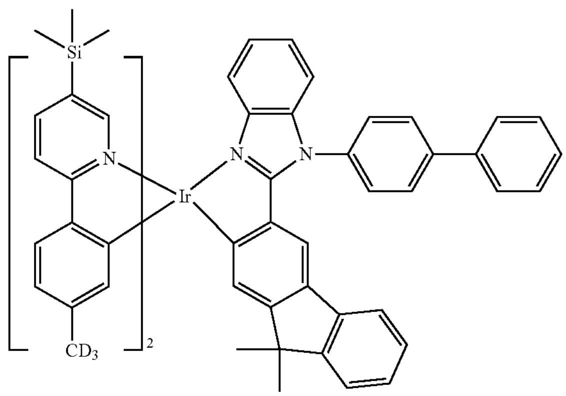
1113
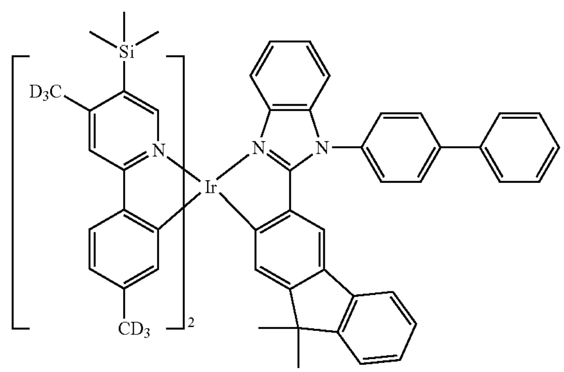
1114
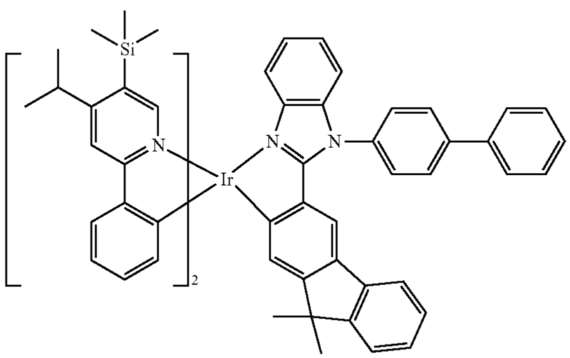
1115
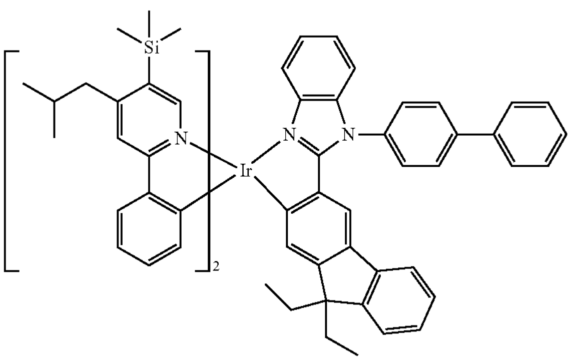
1116
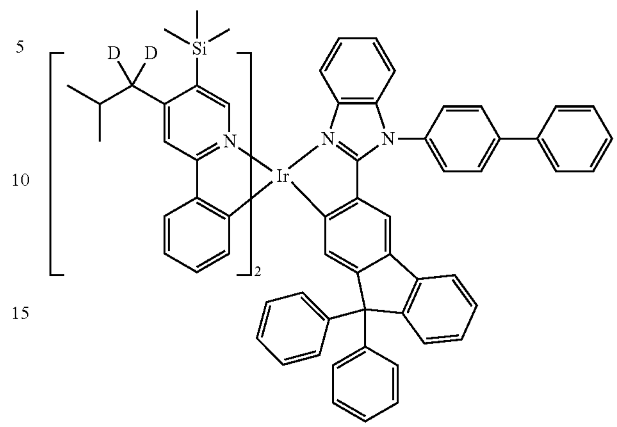
1117
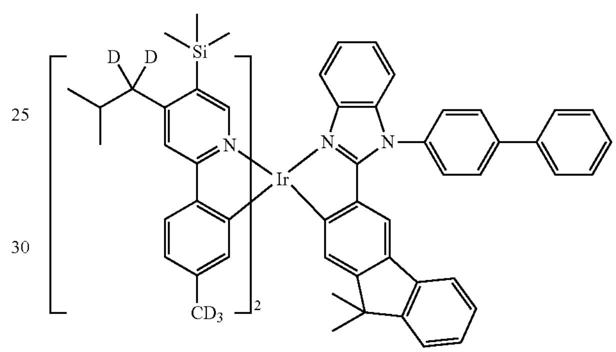
1118
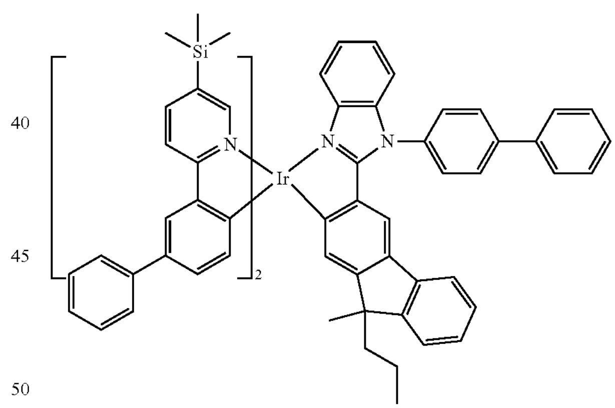
1119
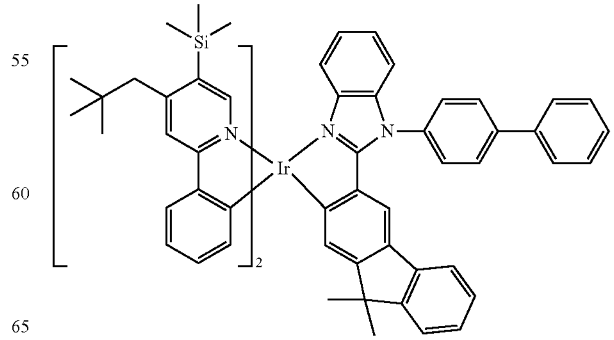

-continued
1120
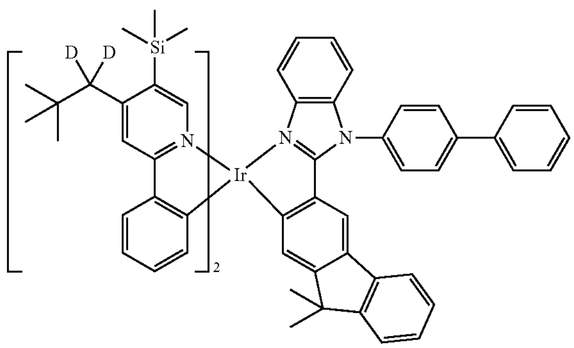
1121
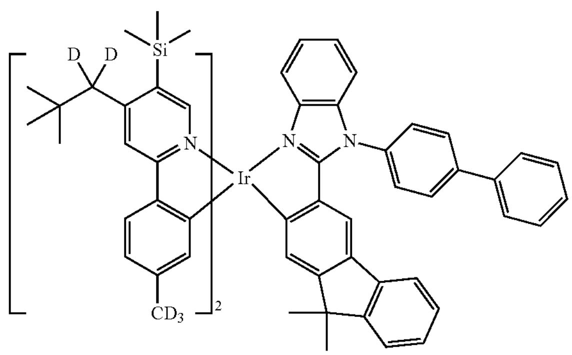
1122
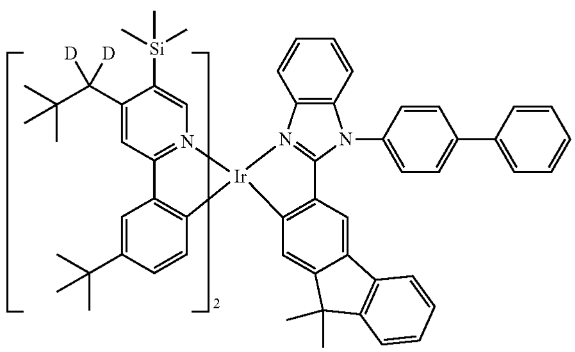
1123
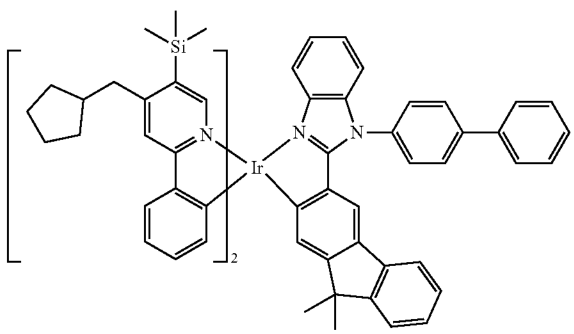
-continued
1124
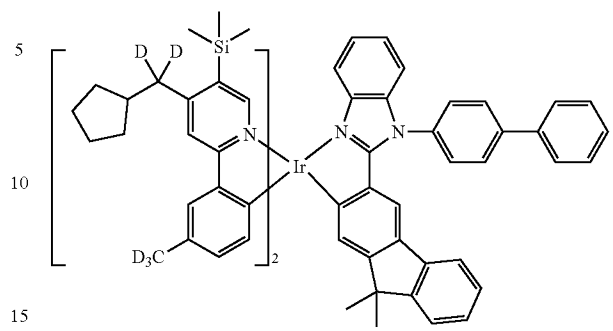
1125
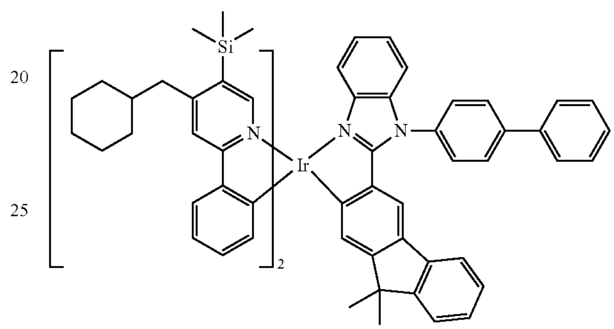
1126
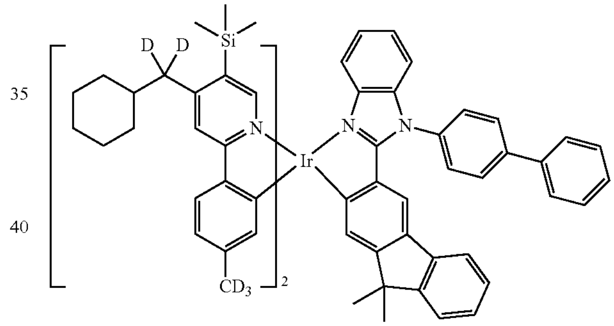
1127
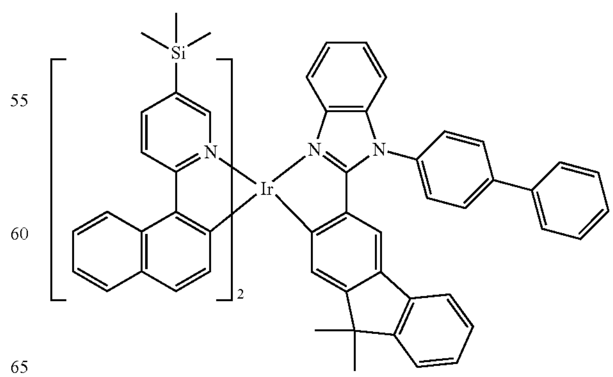

-continued
1128
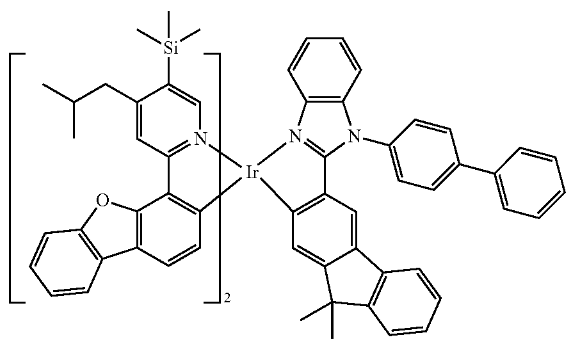
1129
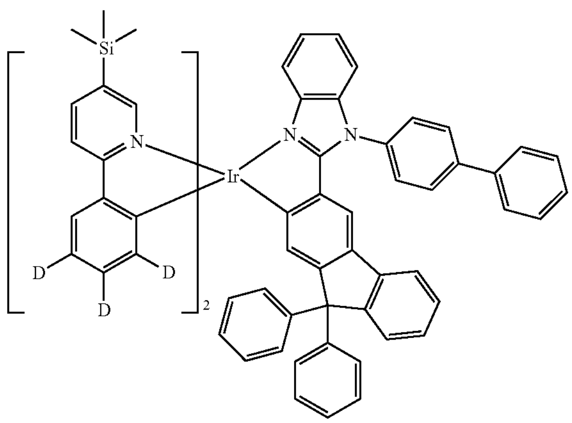
1130
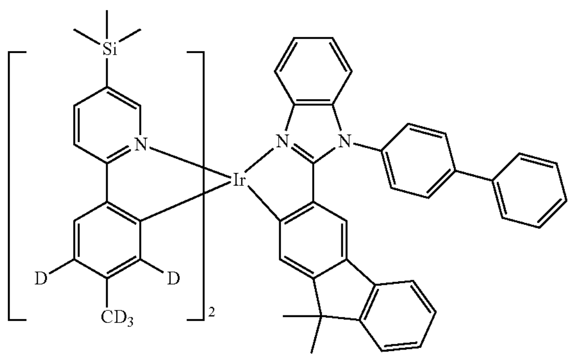
1131
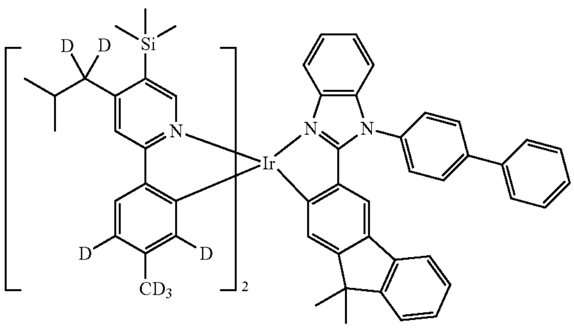
-continued
1132
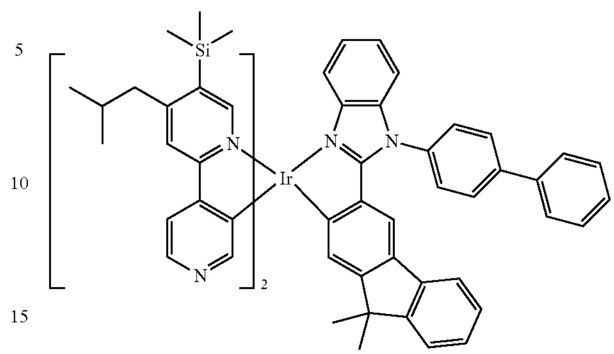
1133
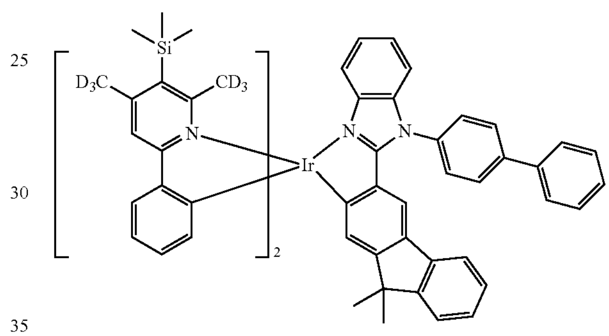
1134
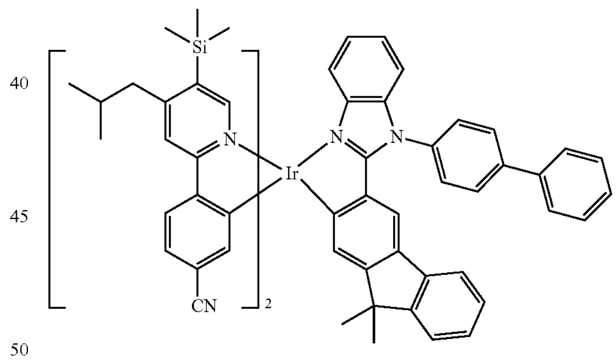
1135
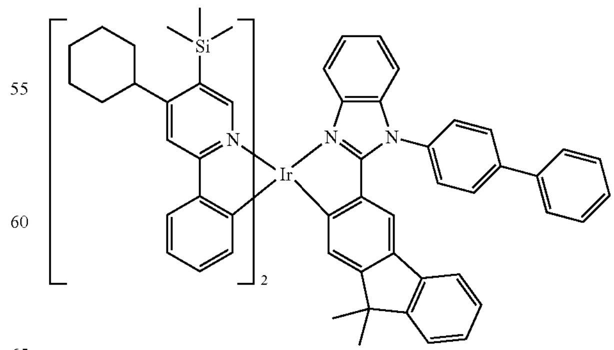

1136
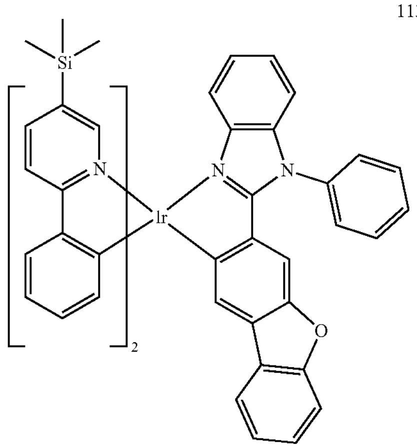
1137
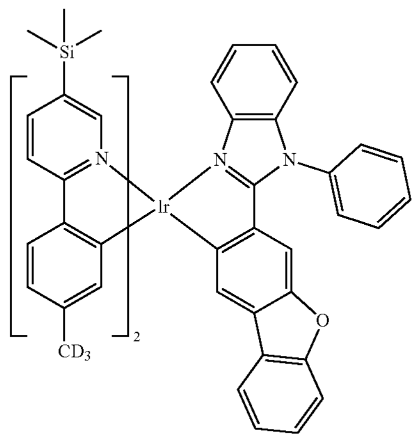
1138
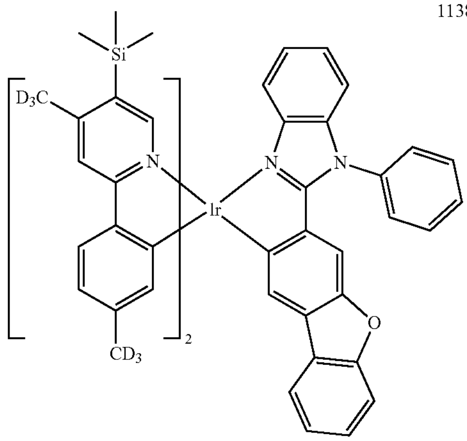
1139
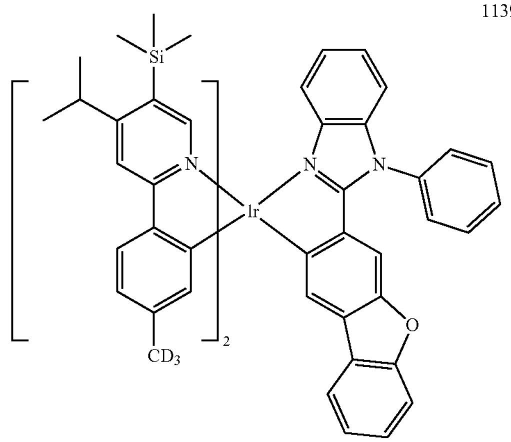
1140
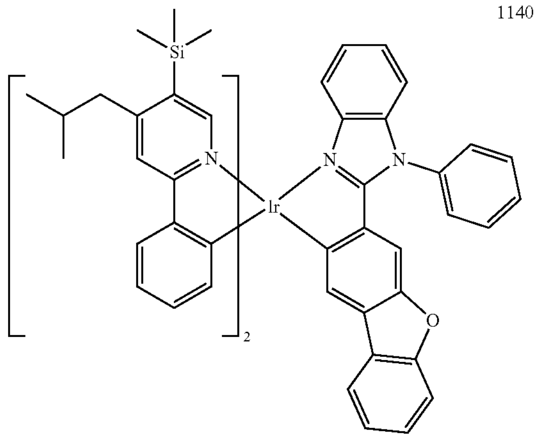
1141
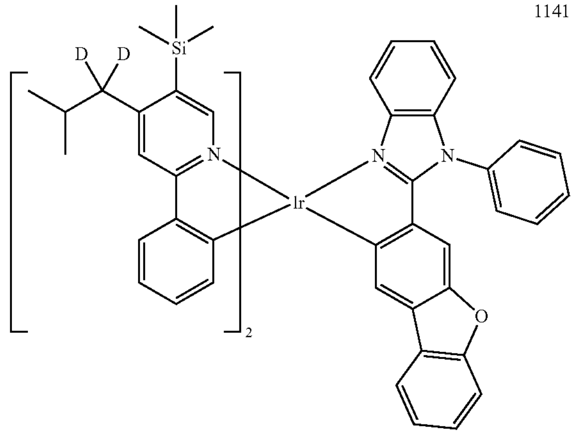

-continued
1142
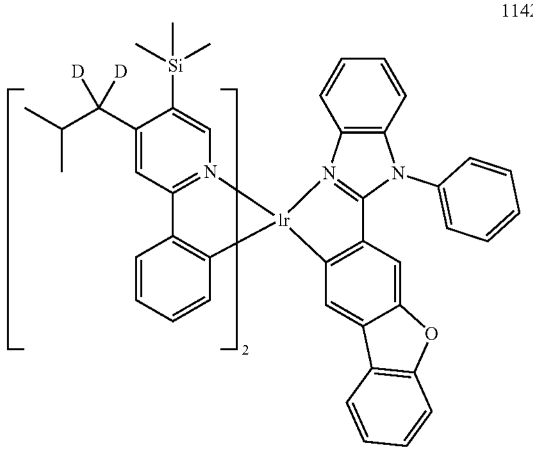
1143
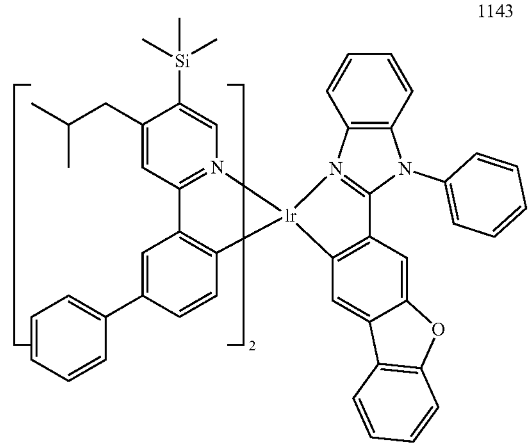
1144
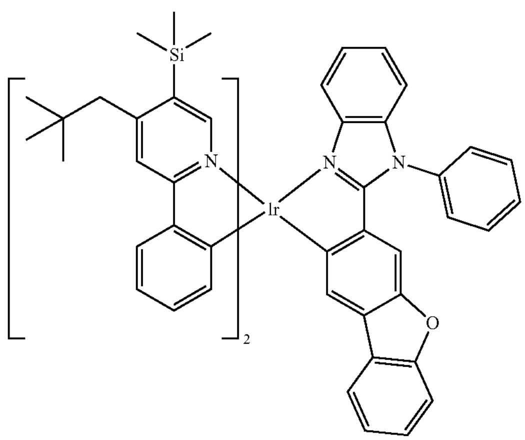
1145
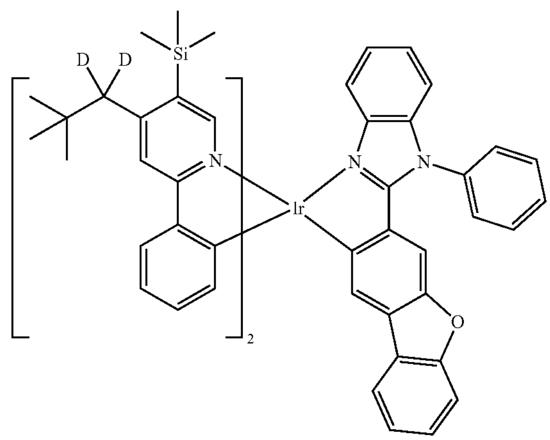
1146
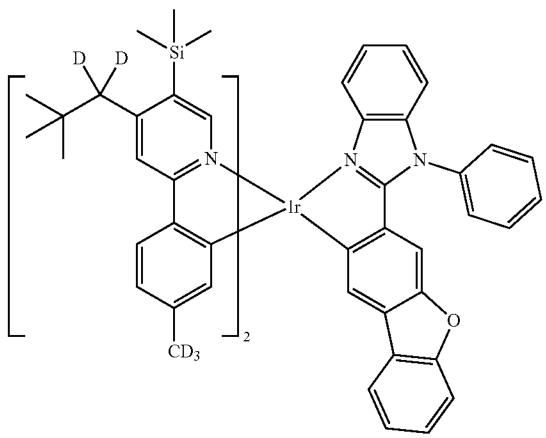
1147
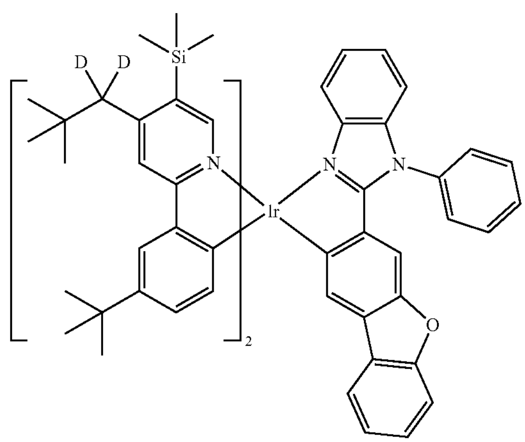

-continued
1148
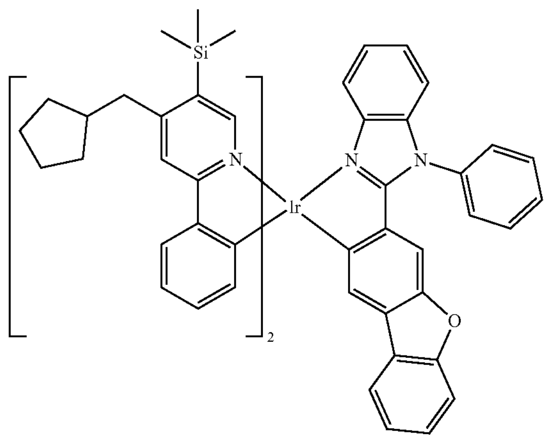
1149
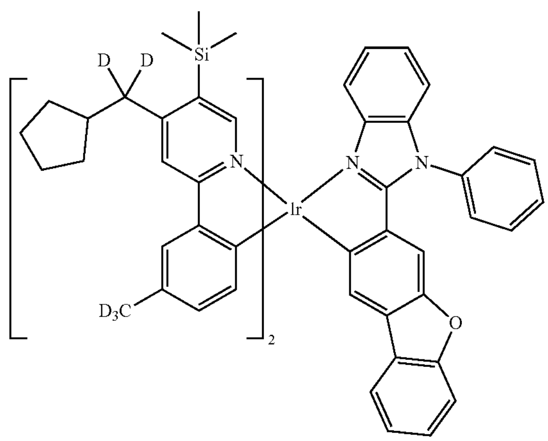
1150
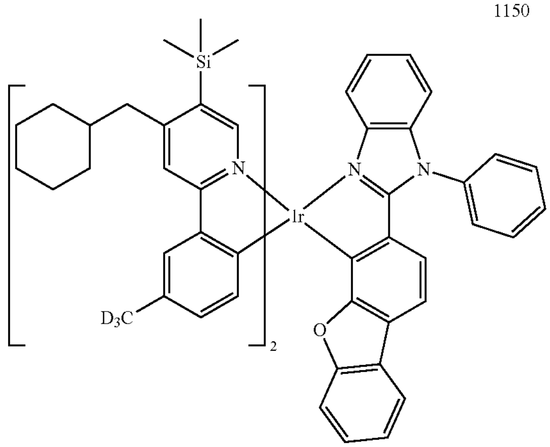
1151
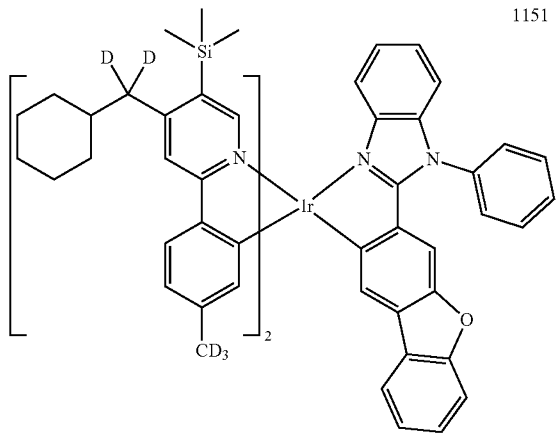
1152
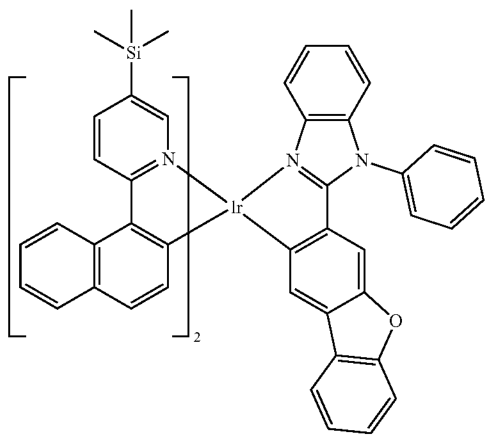
1153
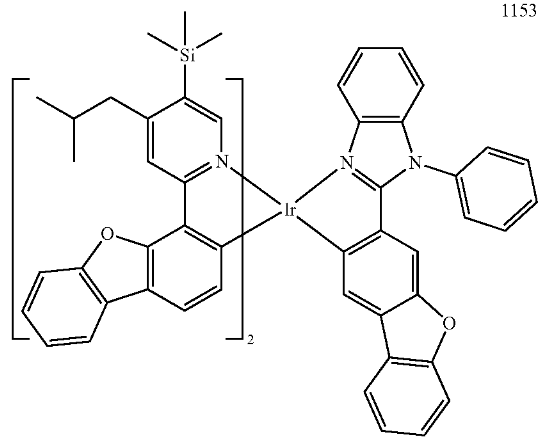

-continued
1154
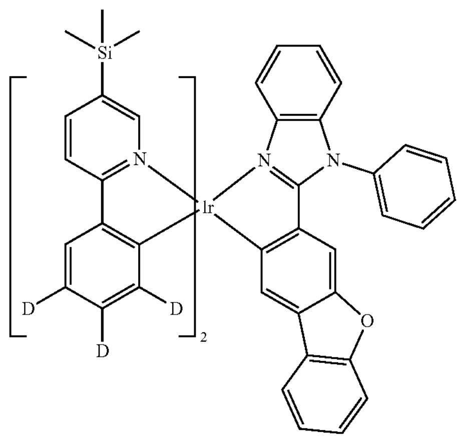
1155
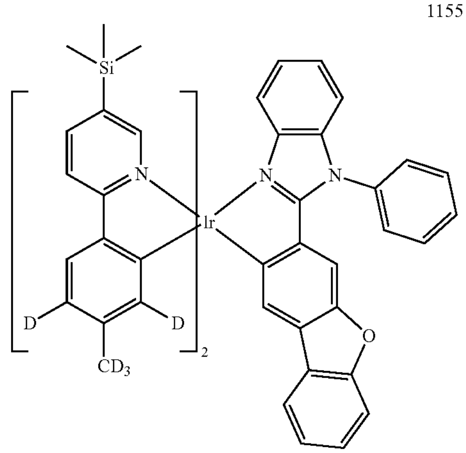
1156
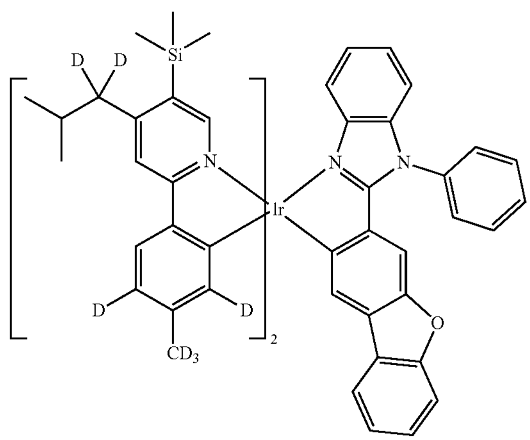
1157
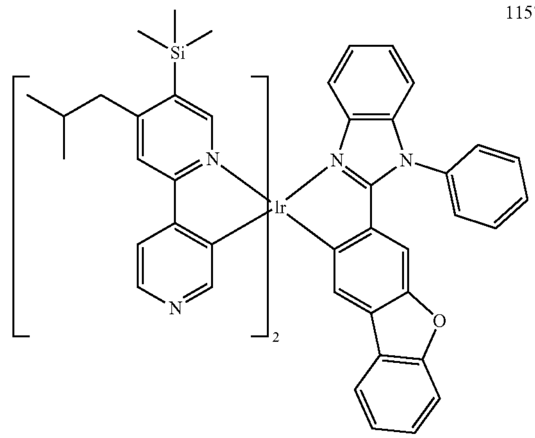
1157
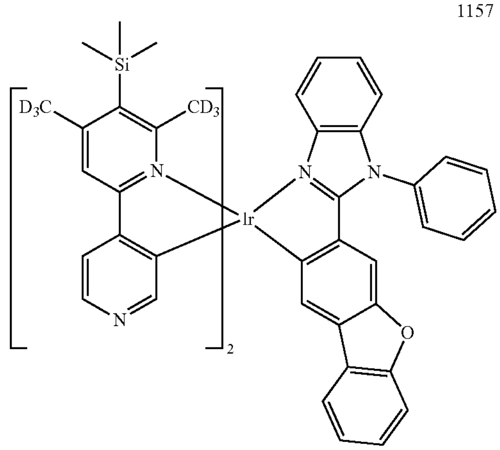
1158
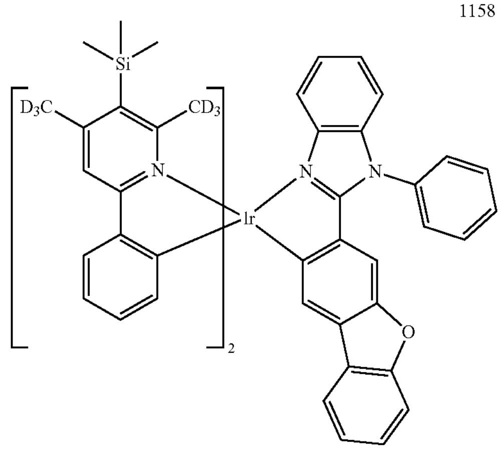

-continued
1159
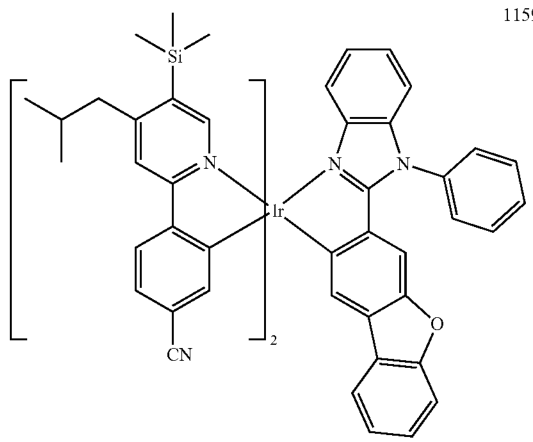
1160
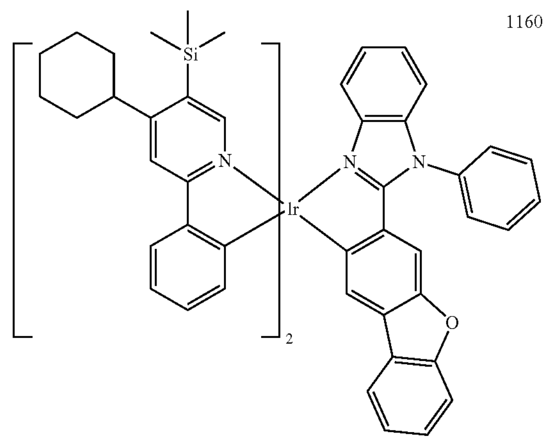
1161
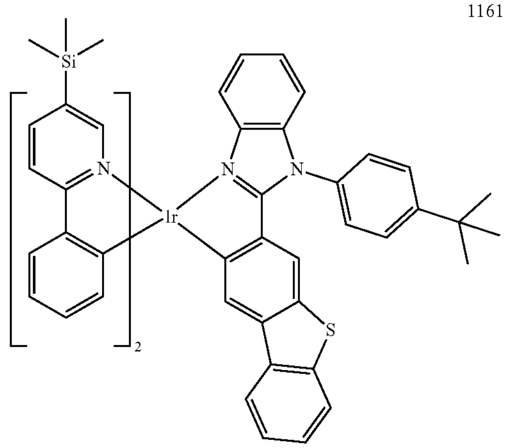
1162
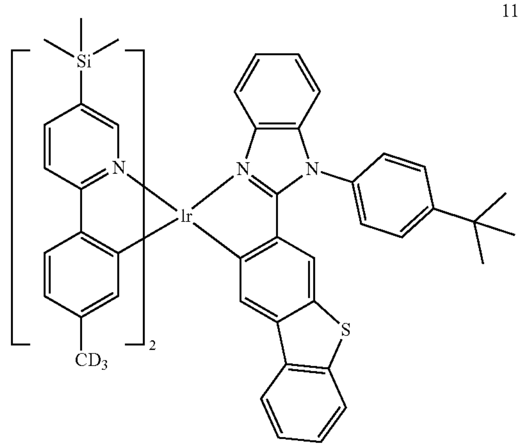
1163
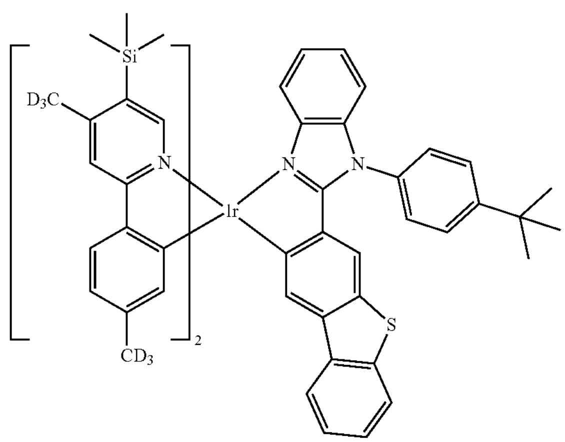
1164
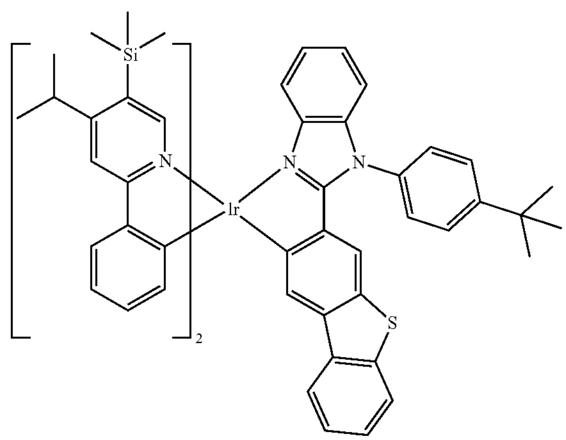

-continued
1165
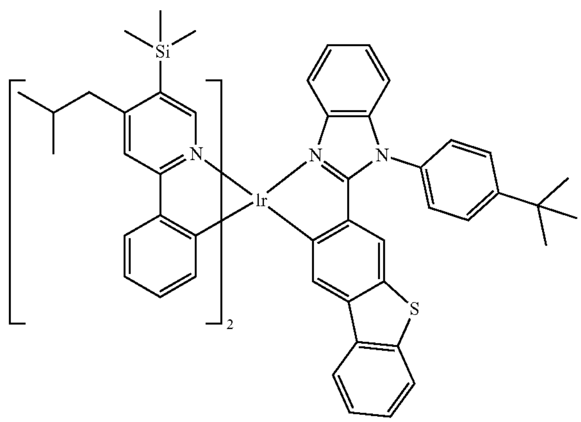
1166
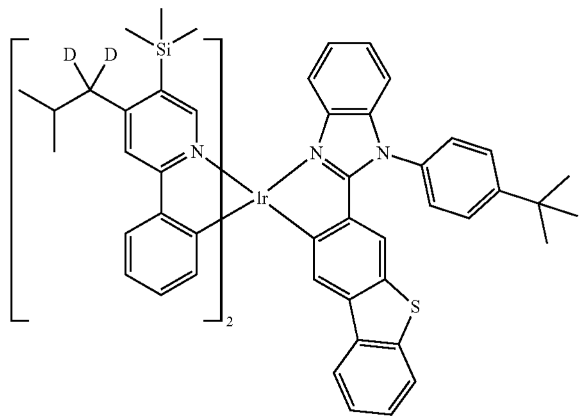
1167
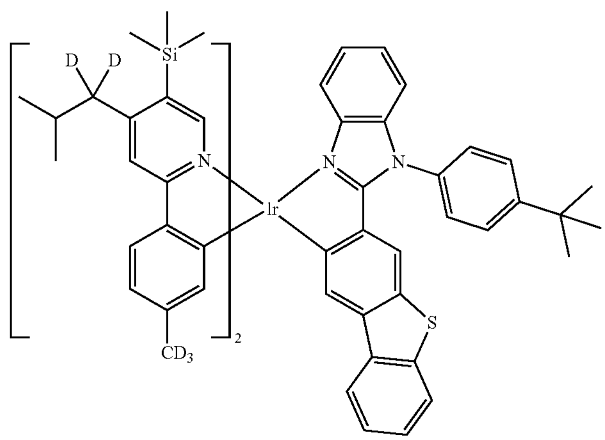
1168
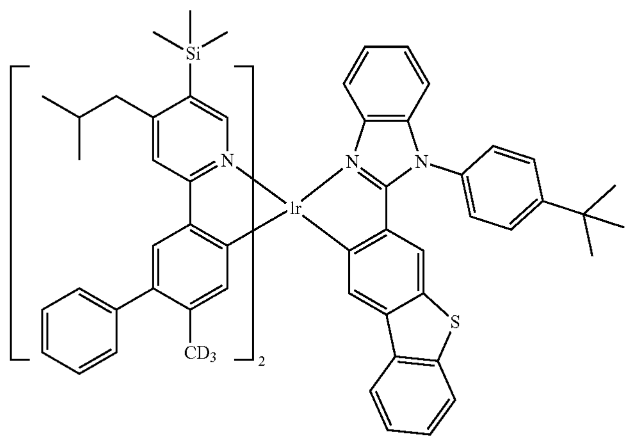

-continued
1169
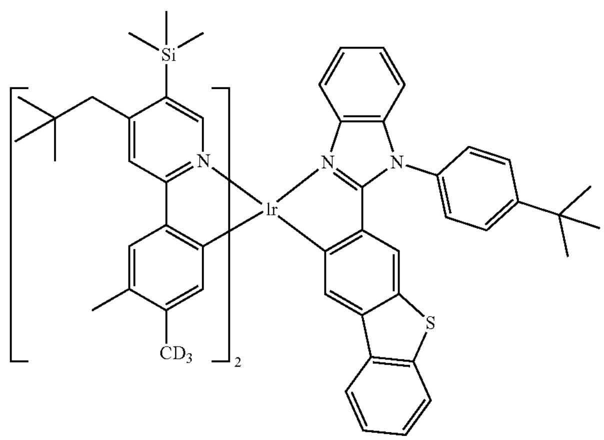
1170
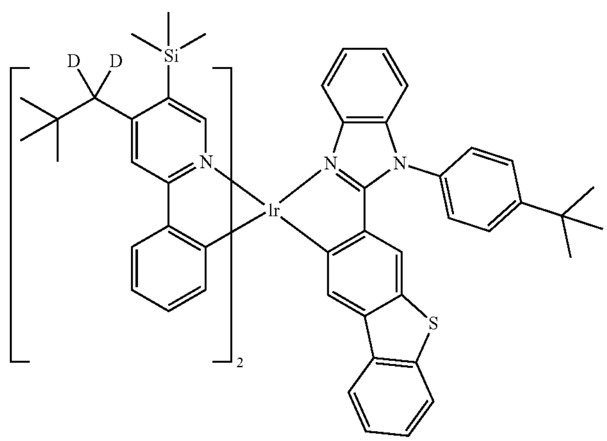
1171
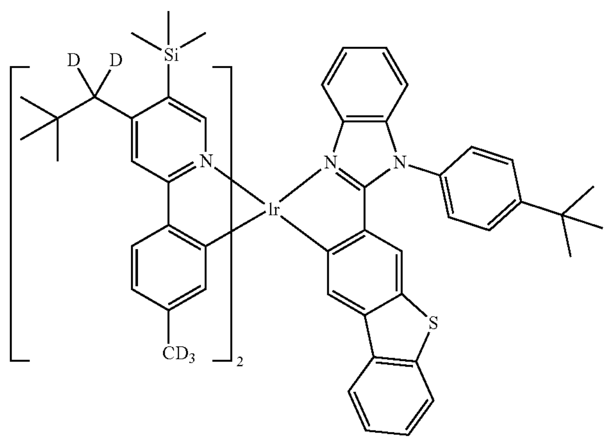

-continued
1172
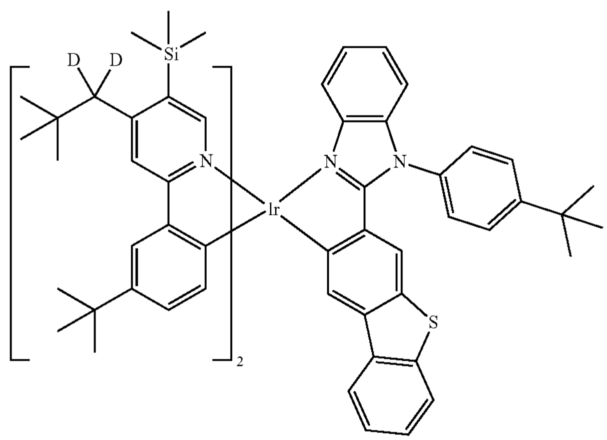
1173
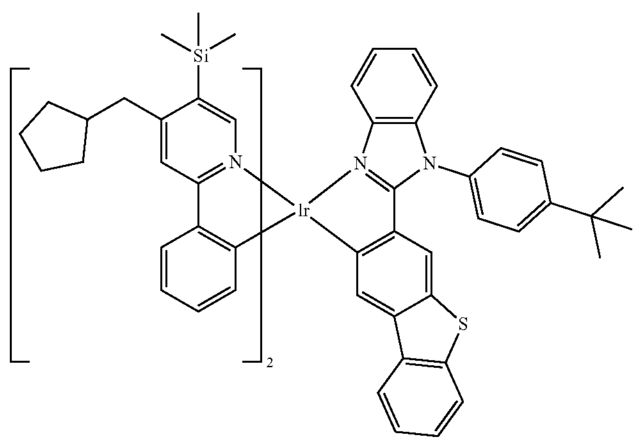
1174
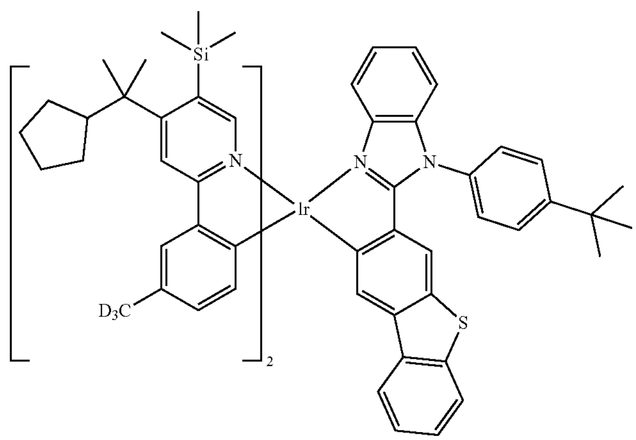

-continued
1175
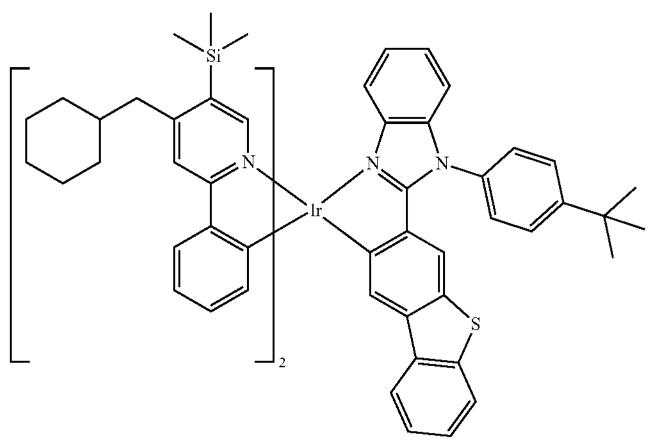
1176
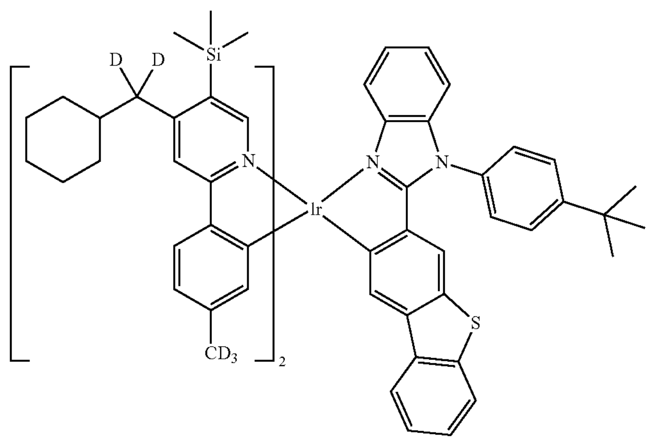
1177
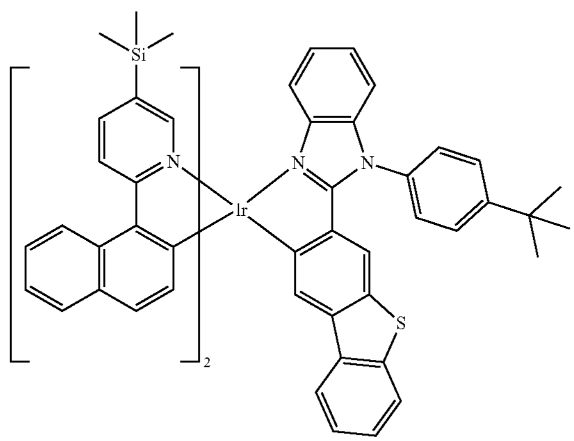

-continued
1178
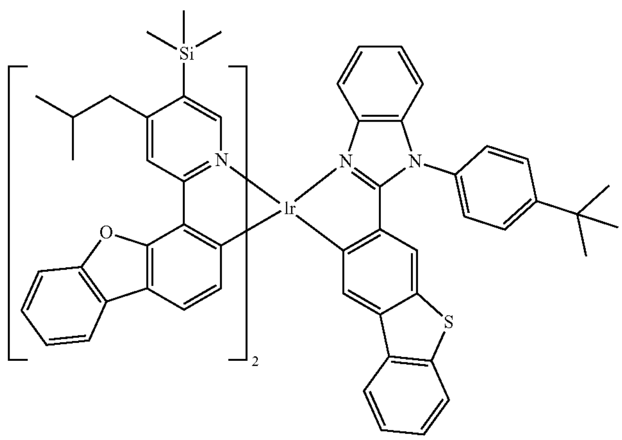
1179
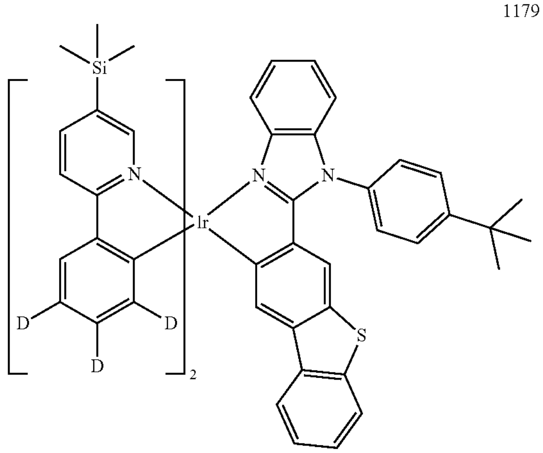
1180
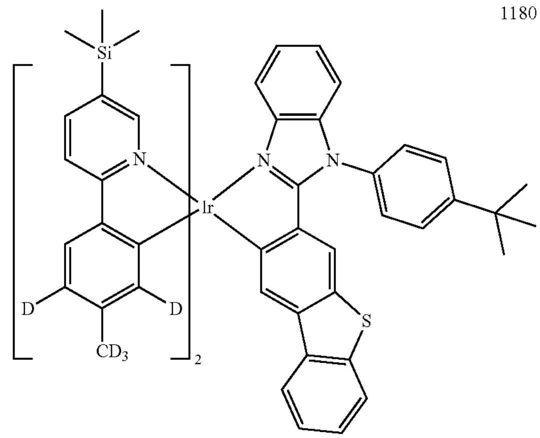
1181
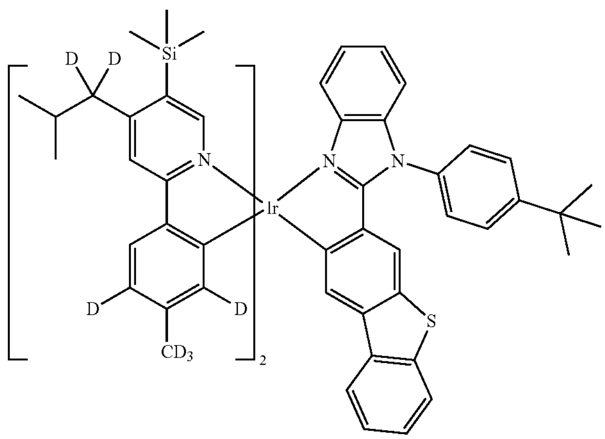

-continued
1182
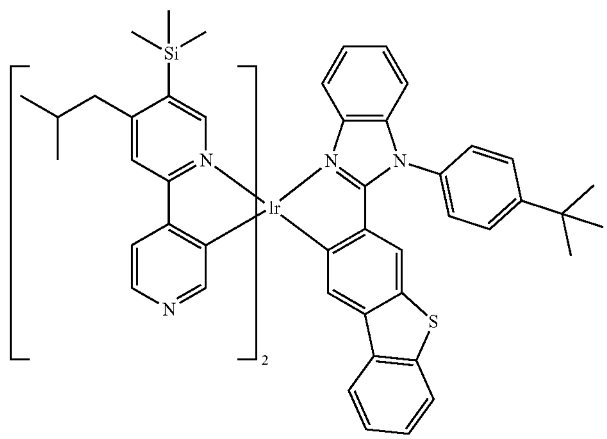
1183
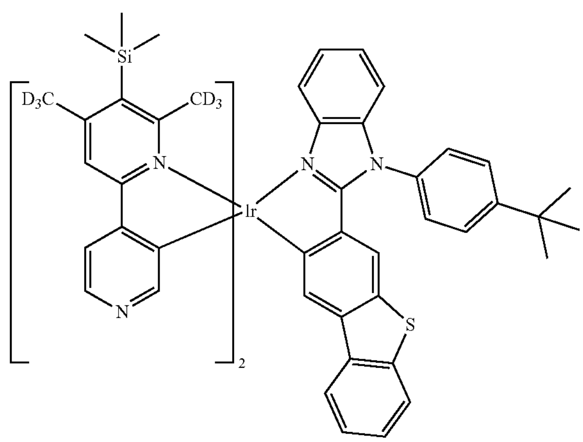
1184
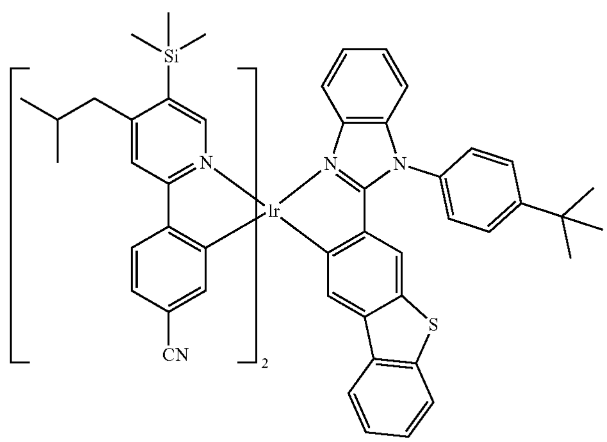

-continued
1185
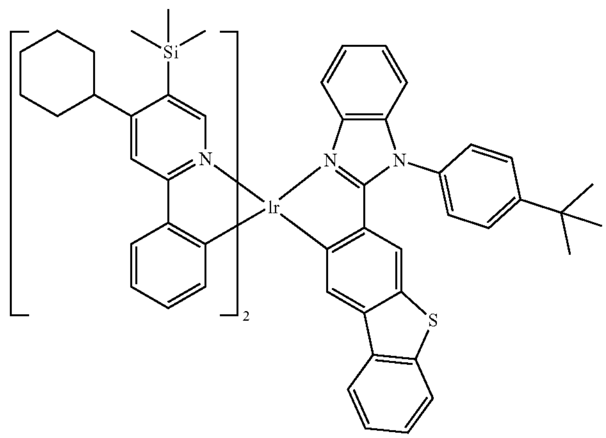
1186
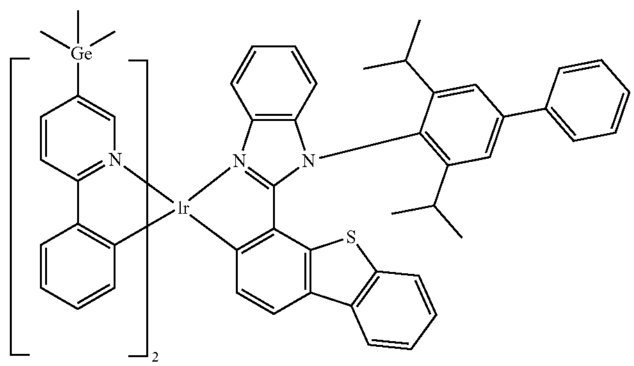
1187
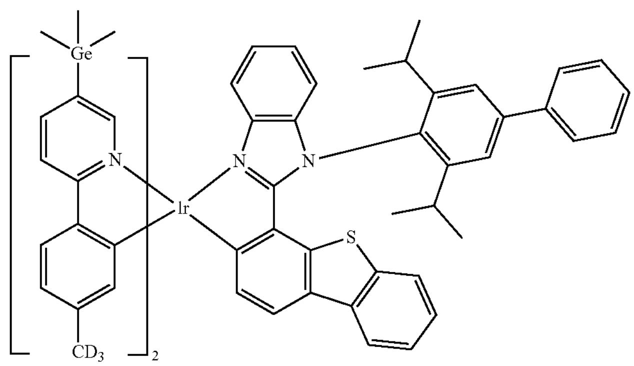
1188
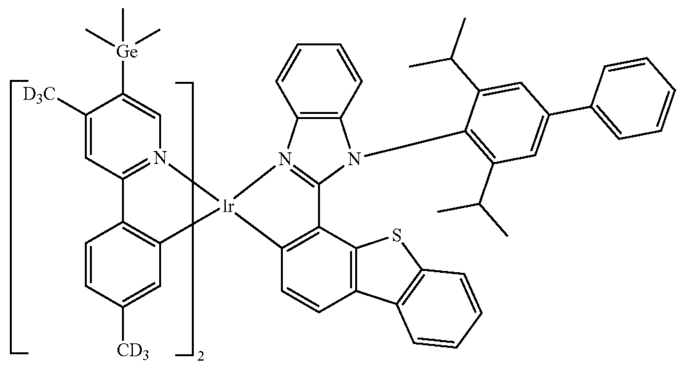

-continued
1189
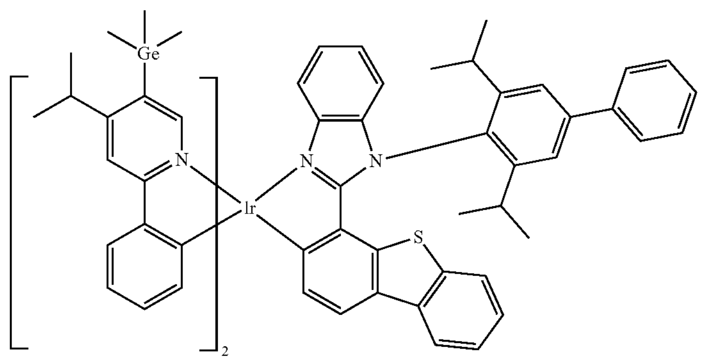
1190
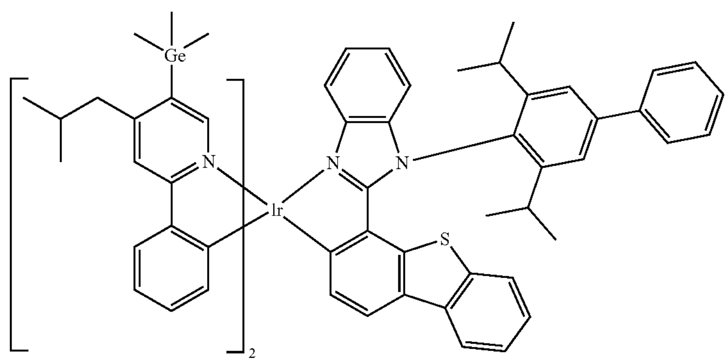
1191
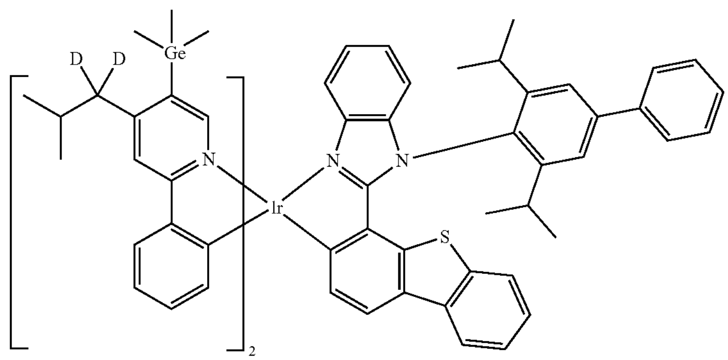
1192
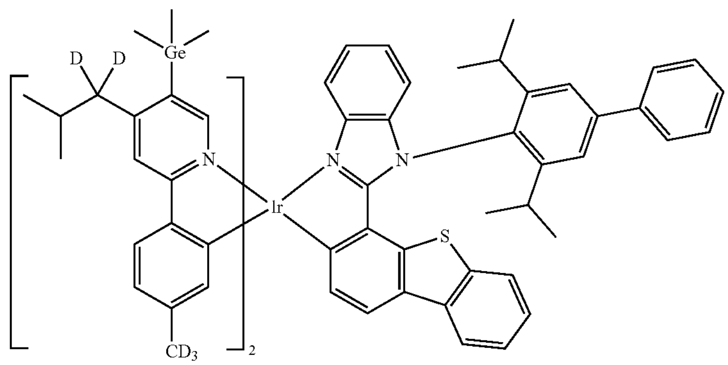

-continued
1193
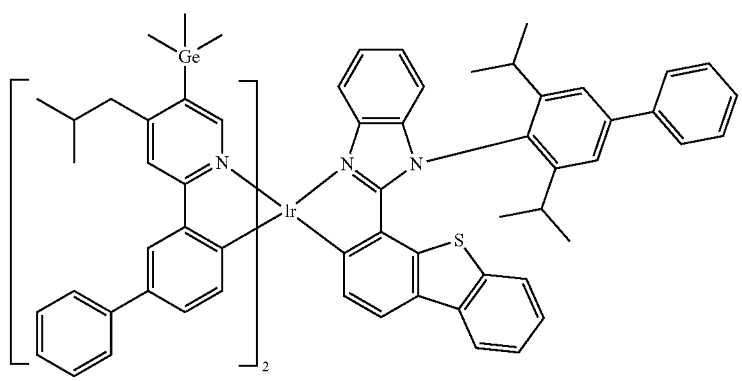
1194
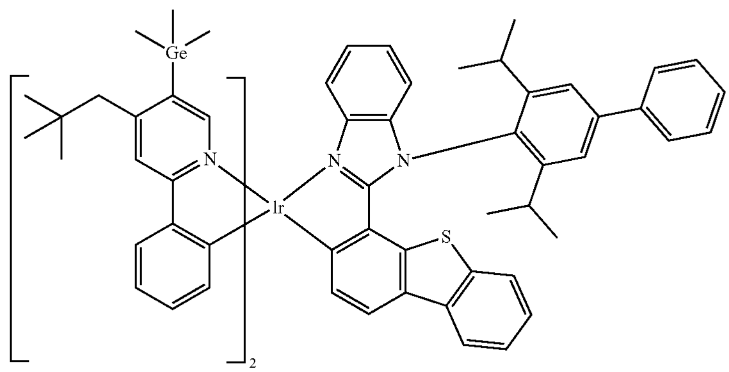
1195
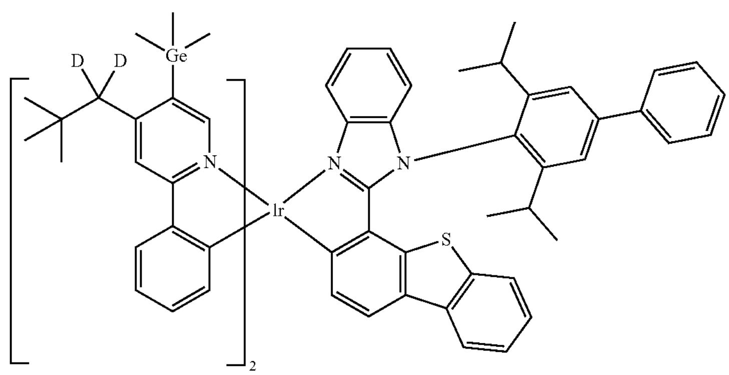
1196
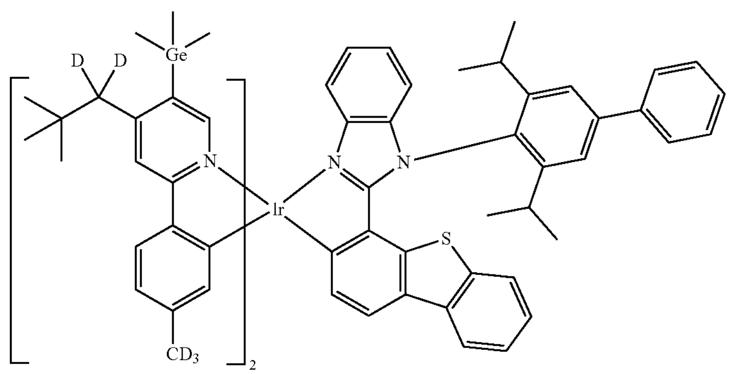

-continued
1197
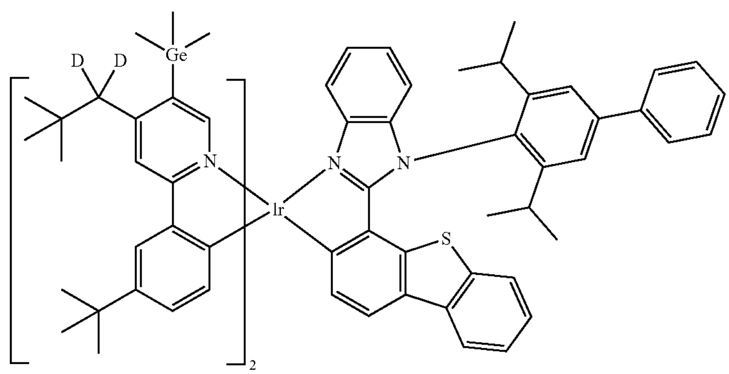
1198
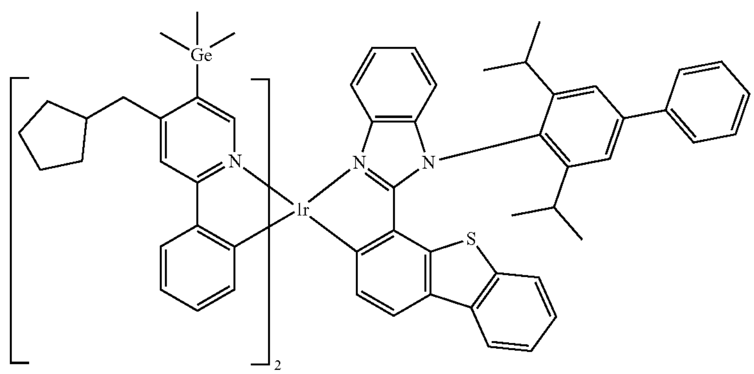
1199
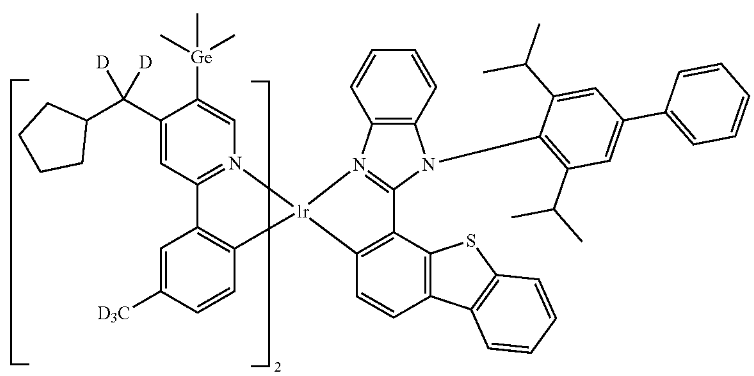
1200
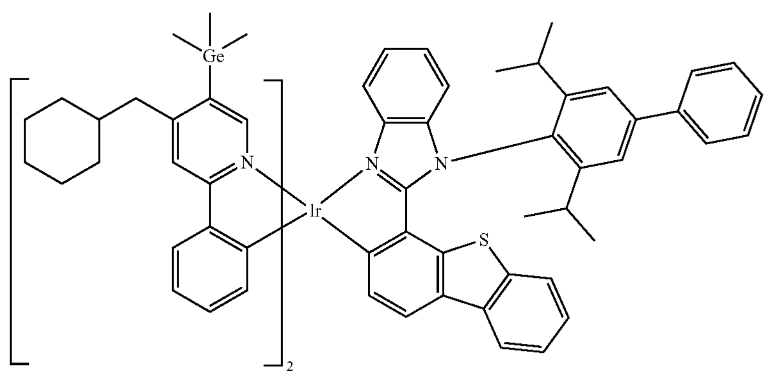

-continued
1201
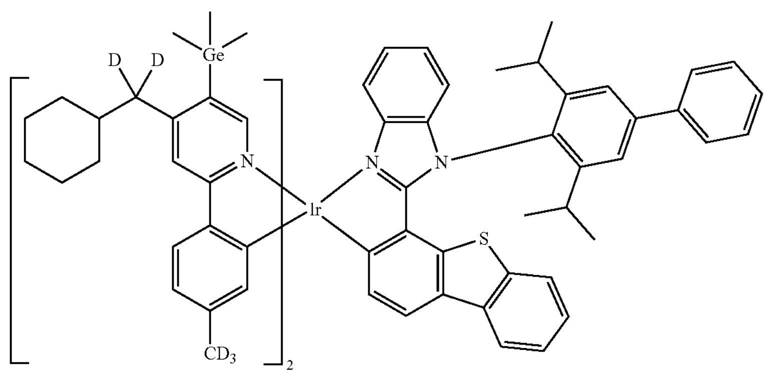
1202
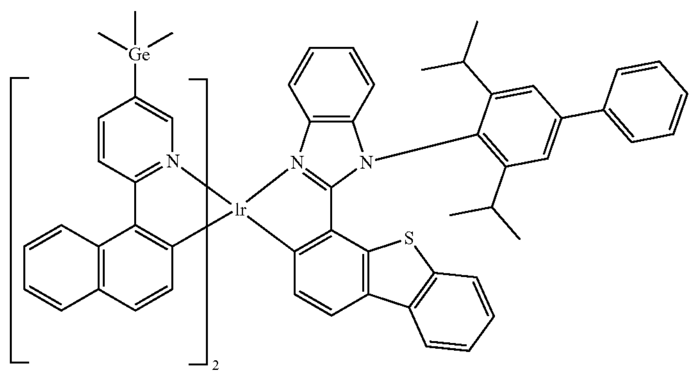
1203
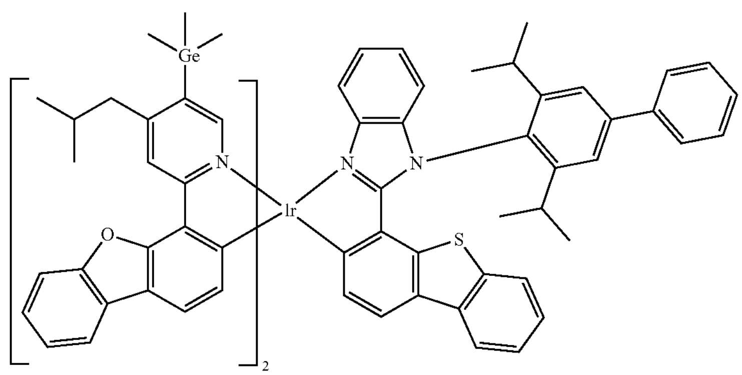
1204
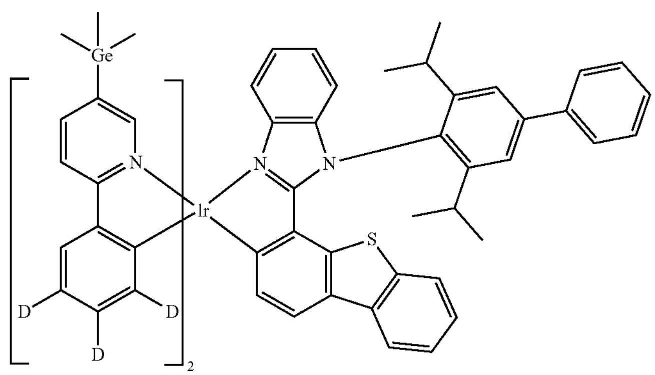

-continued
1205
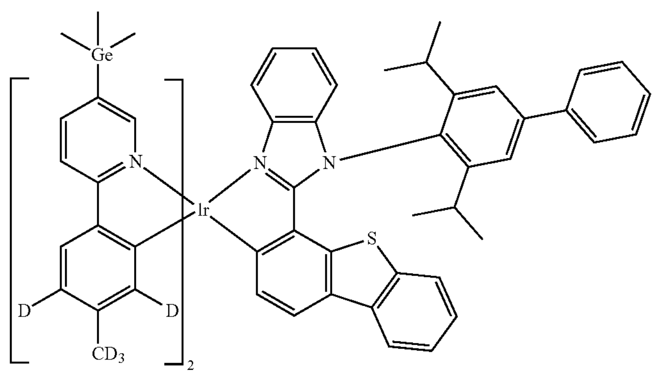
1206
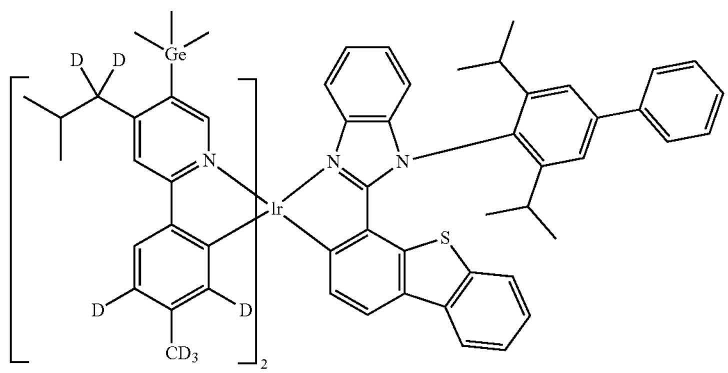
1207
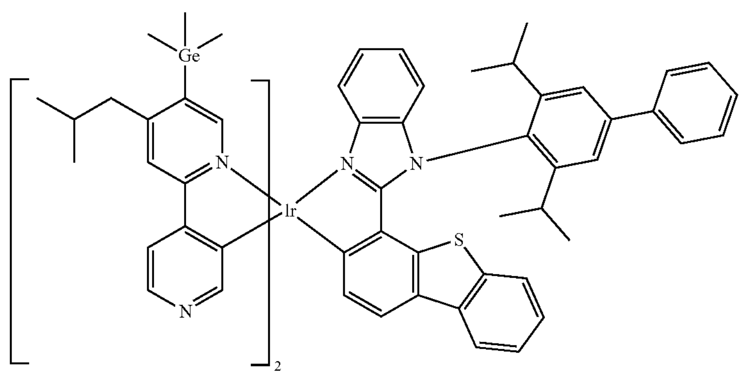
1208
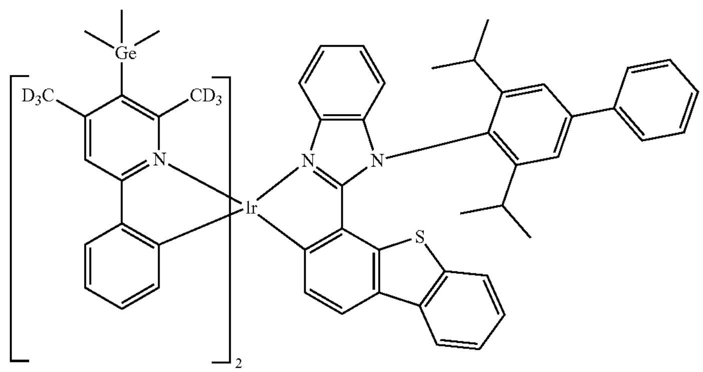

-continued
1209
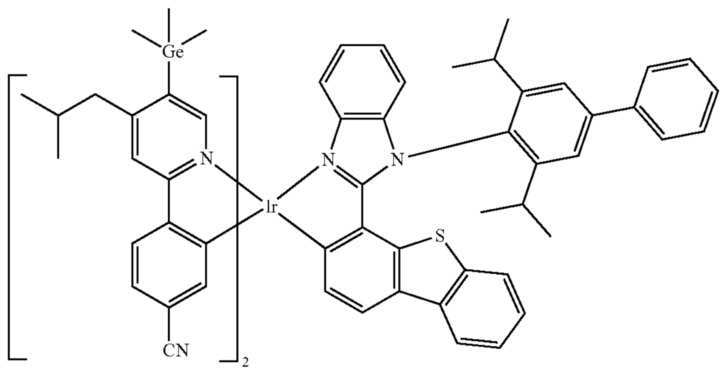
1210
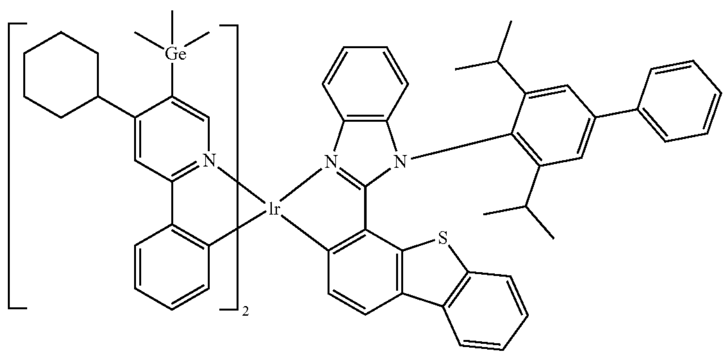
1211
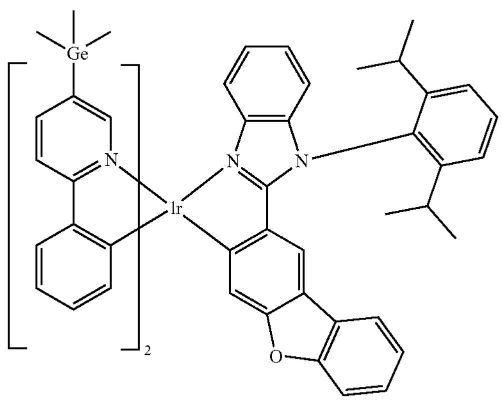
1212
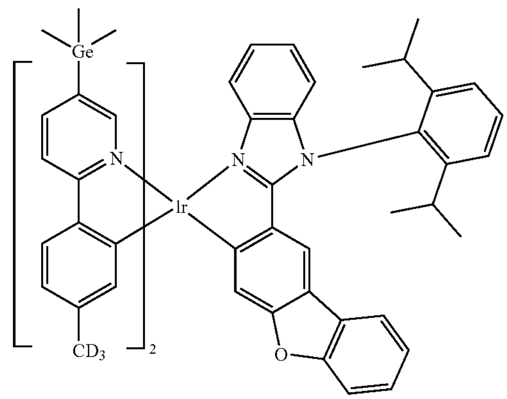
1213
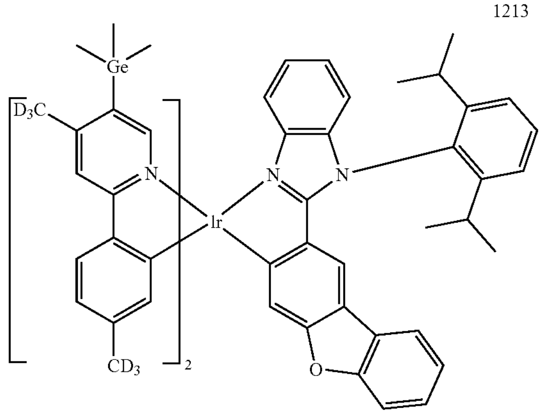
1214
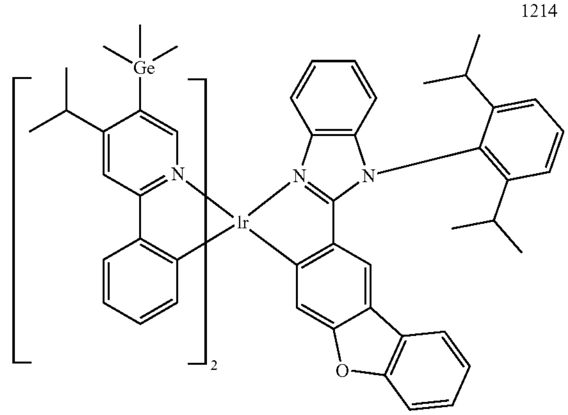

-continued
1215
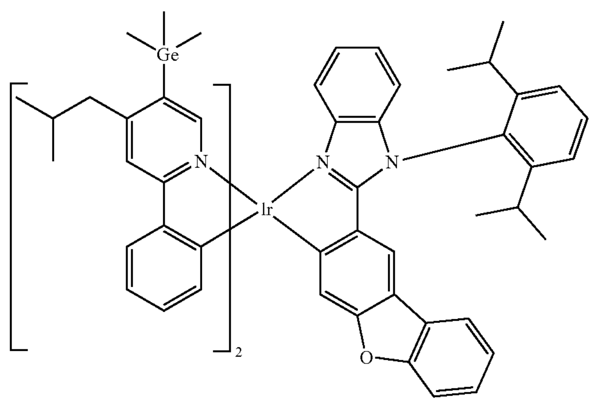
1216
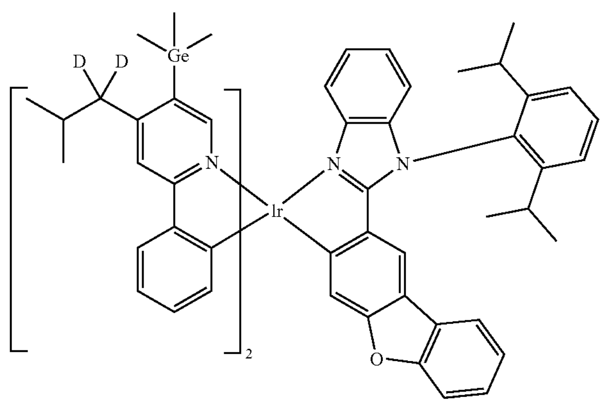
1217
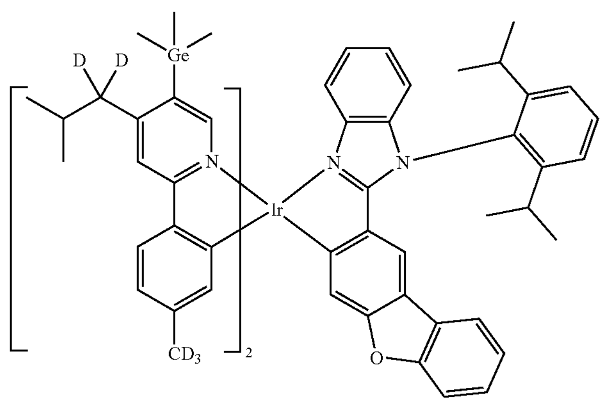
1218
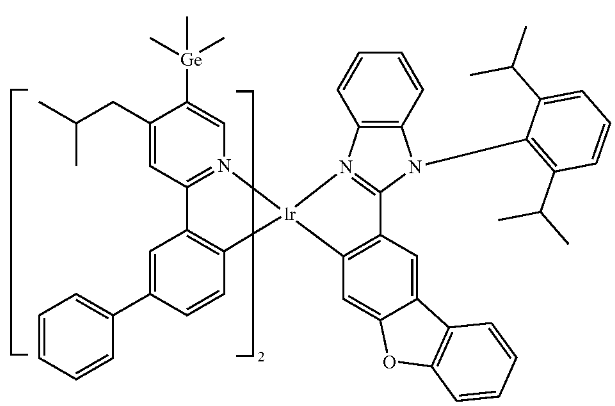

-continued
1219
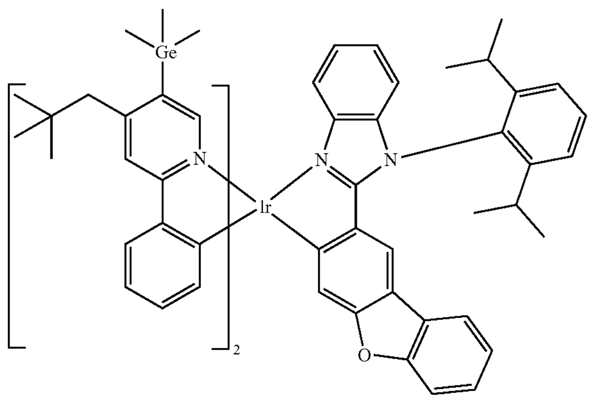
1220
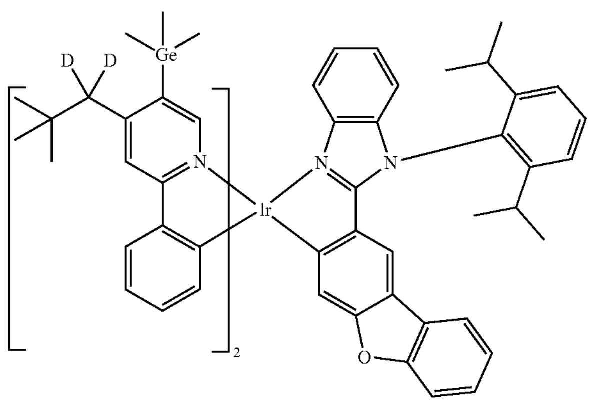
1221
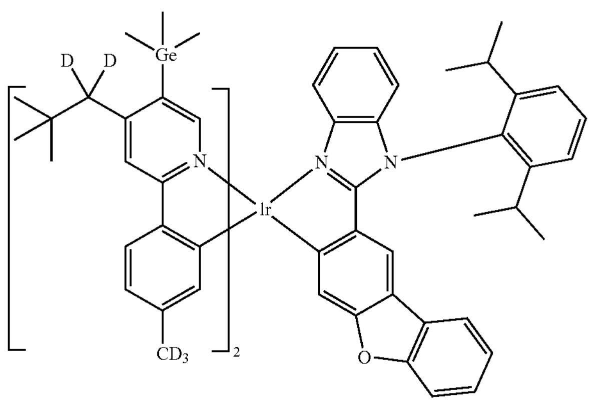
1222
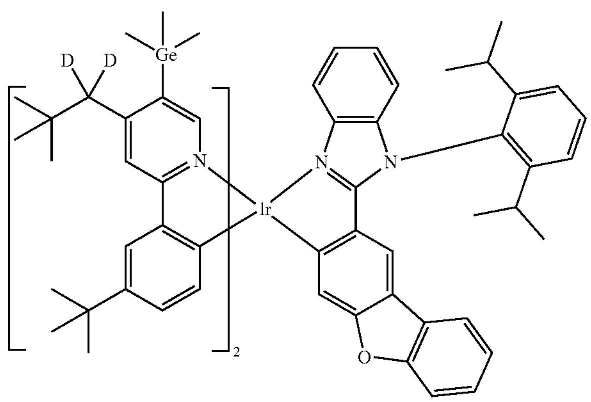

-continued
1223
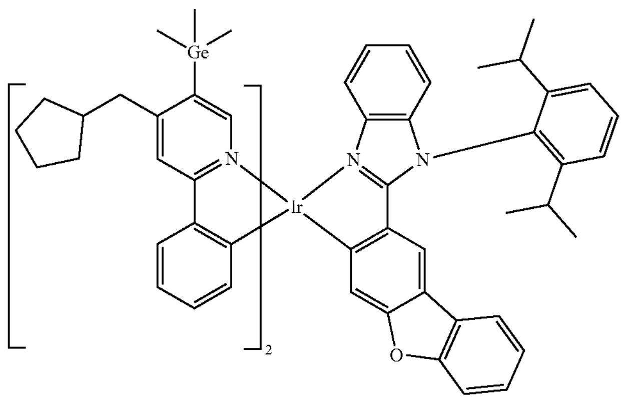
1224
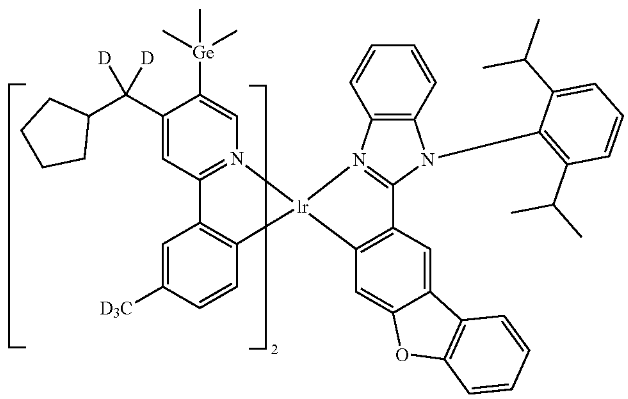
1225
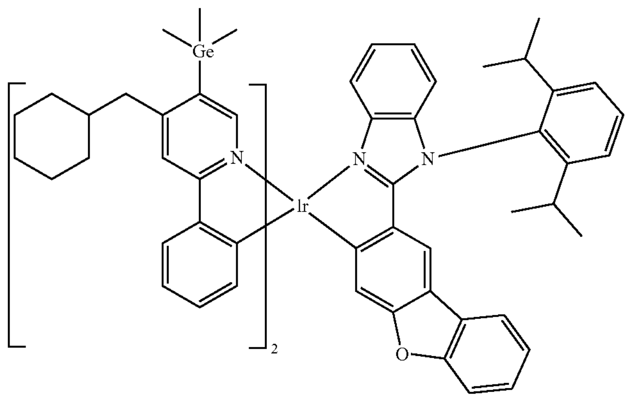
1226
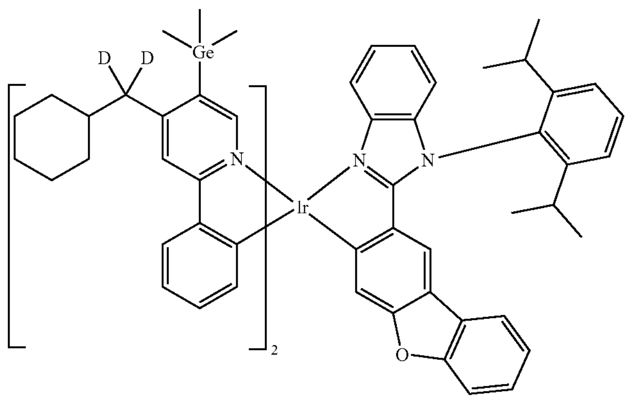

-continued
1227
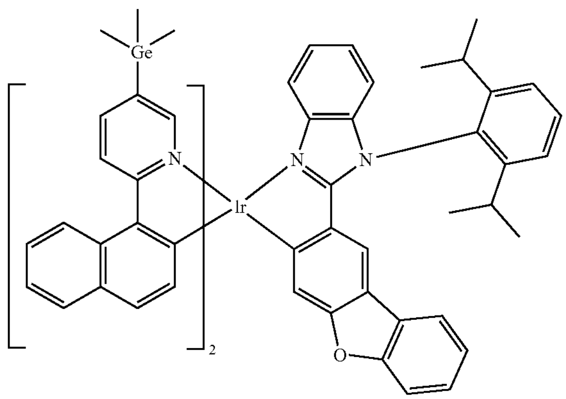
1228
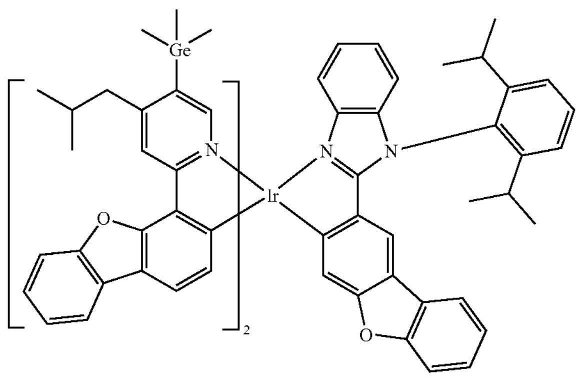
1229
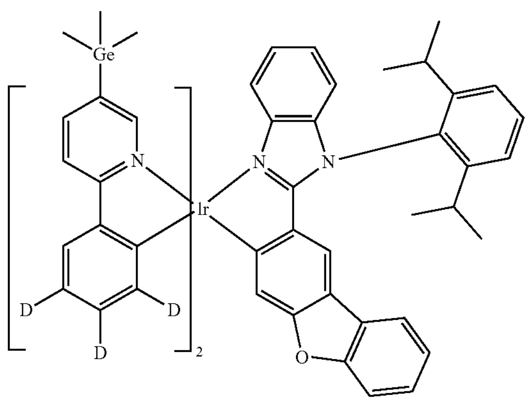
1230
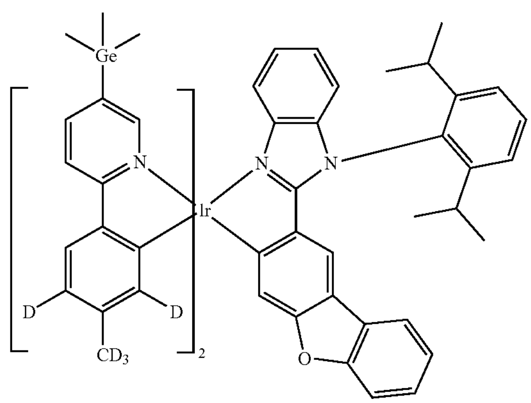
1231
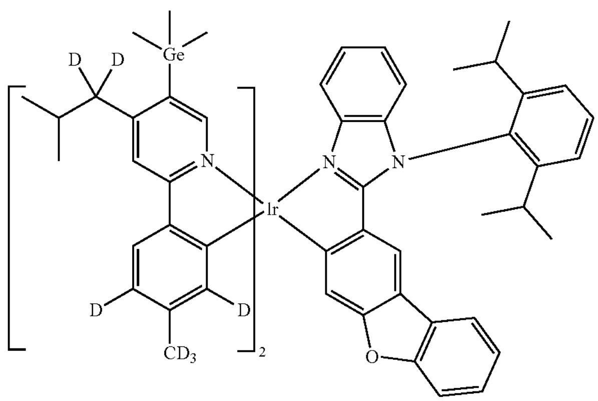

-continued
1232
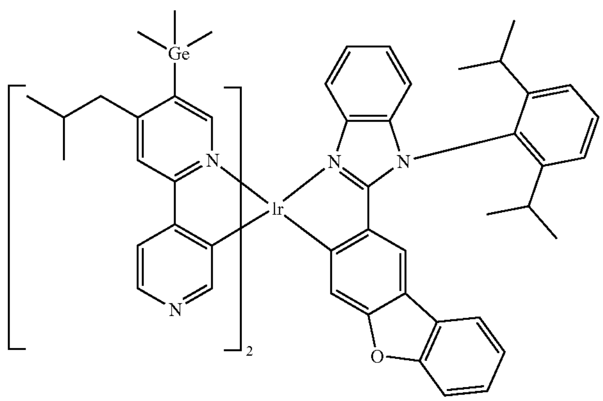
1233
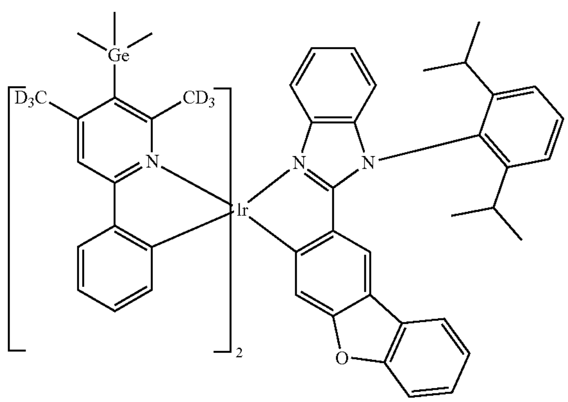
1234
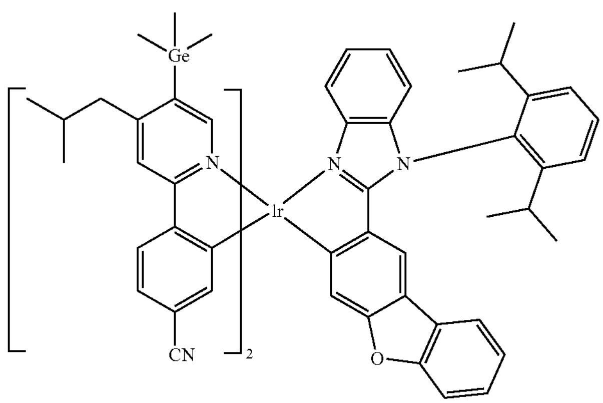
1235
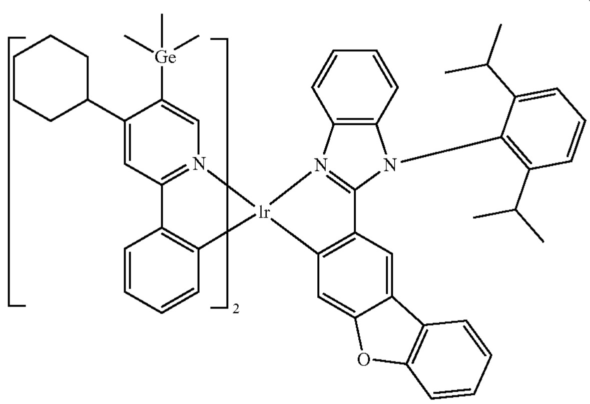

-continued
1236
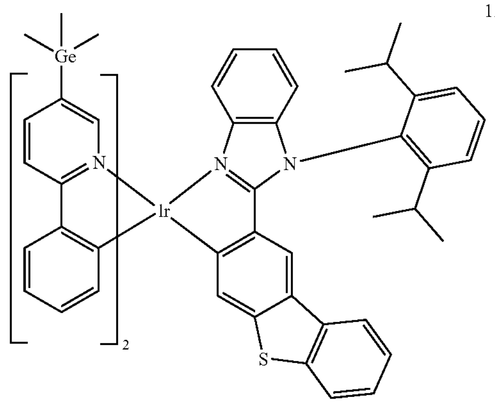
1237
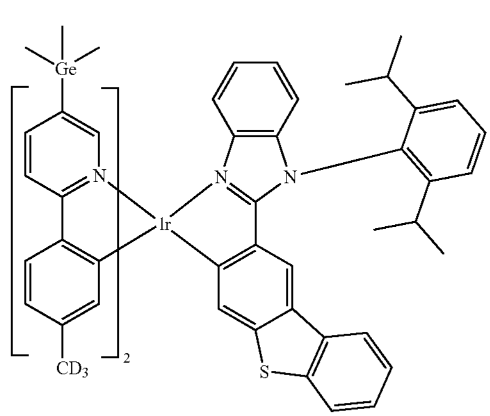
1238
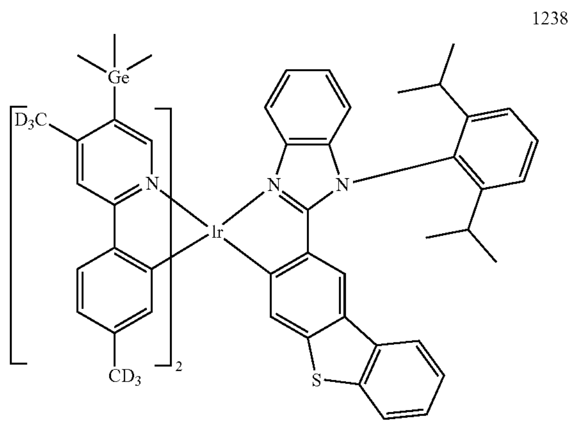
1239
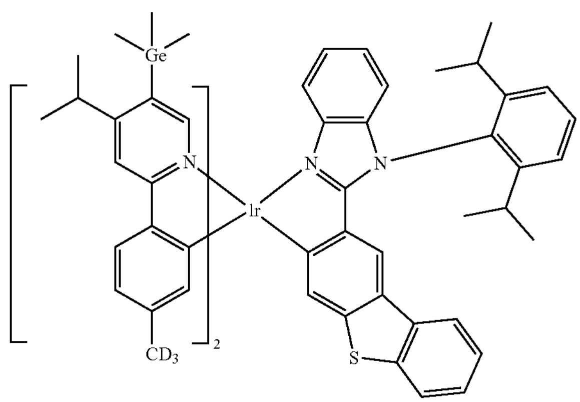
1240
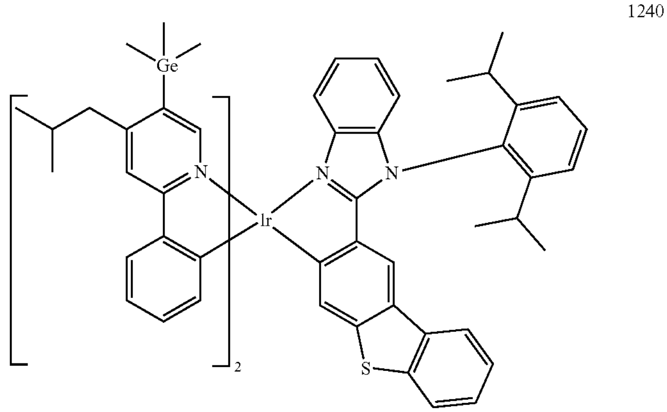

-continued
1241
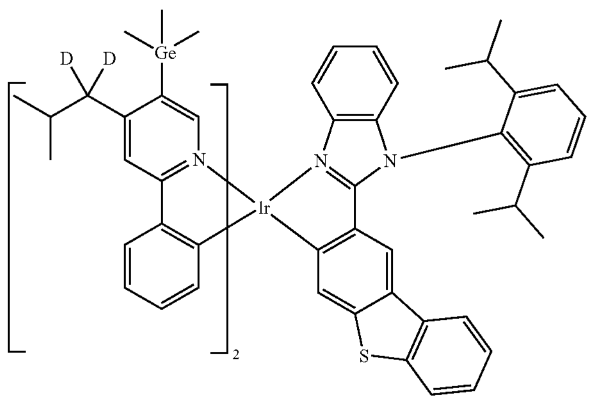
1242
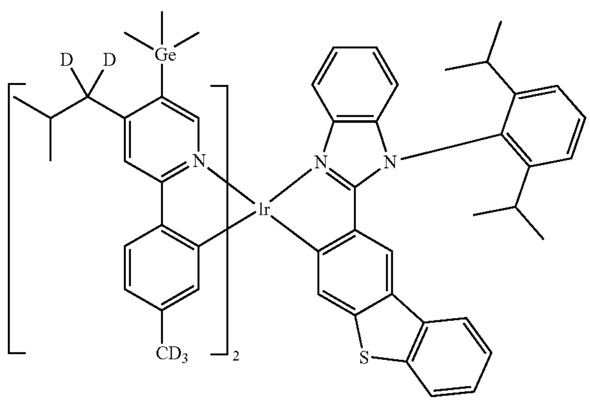
1243
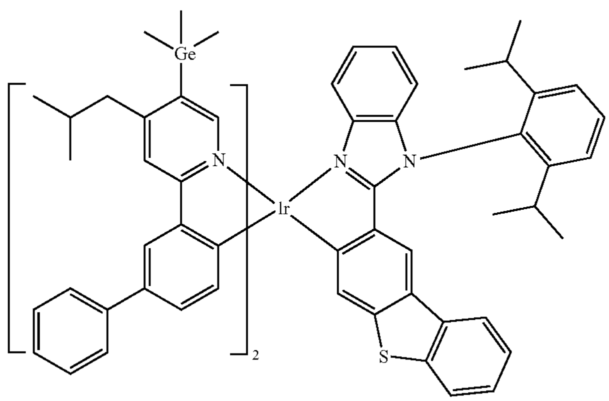
1244
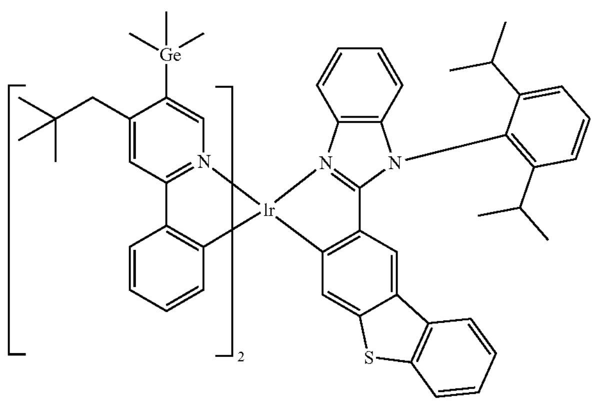

-continued
1245
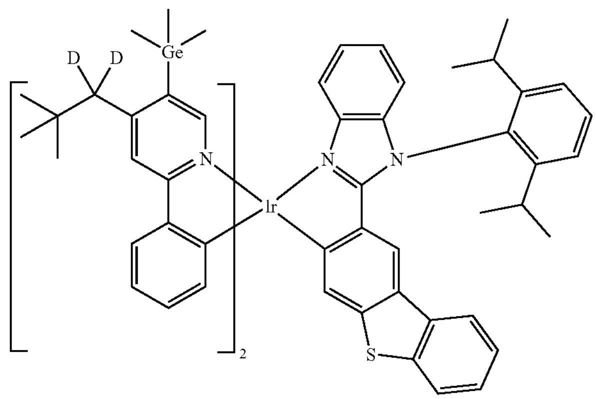
1246
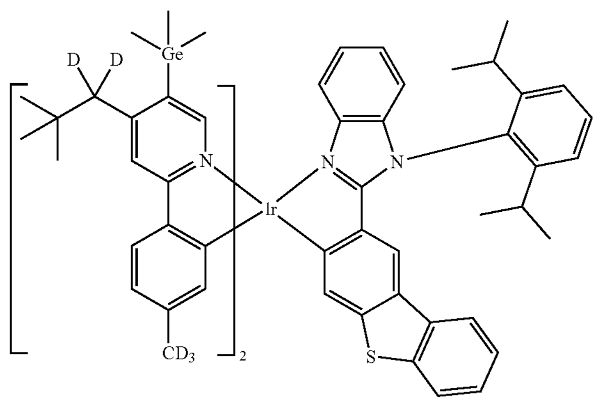
1247
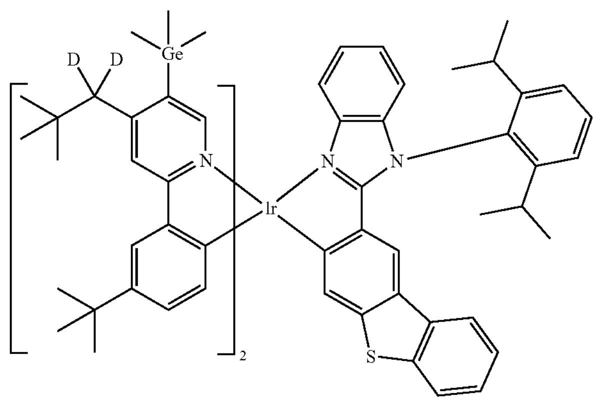
1248
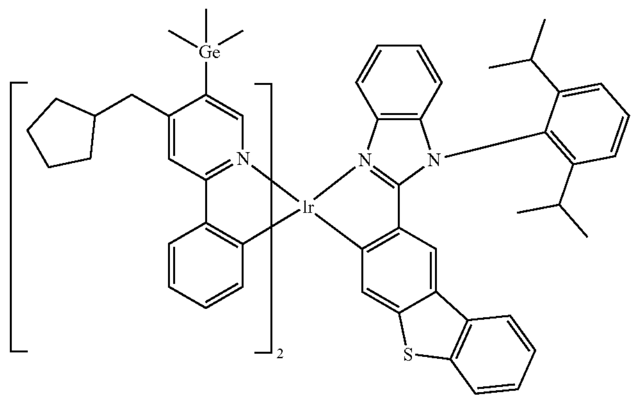

-continued
1249
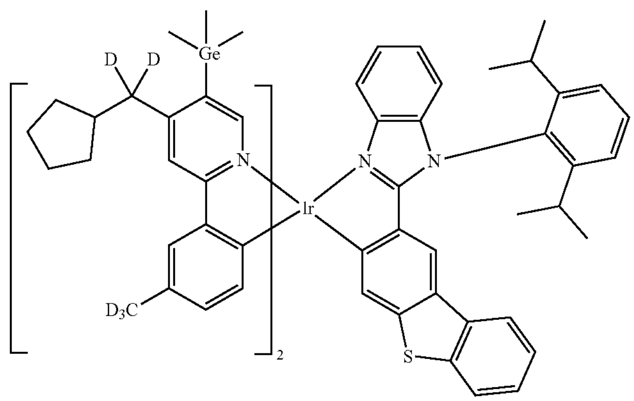
1250
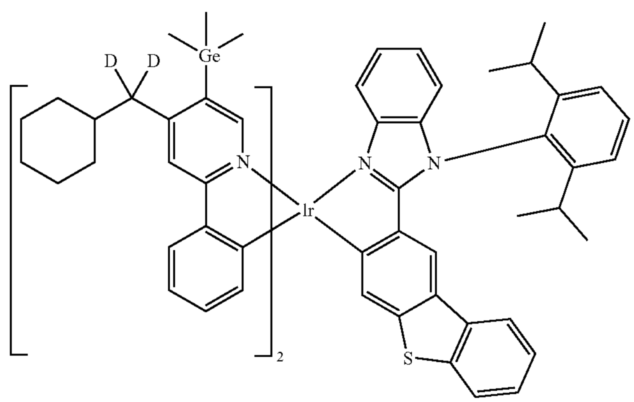
1251
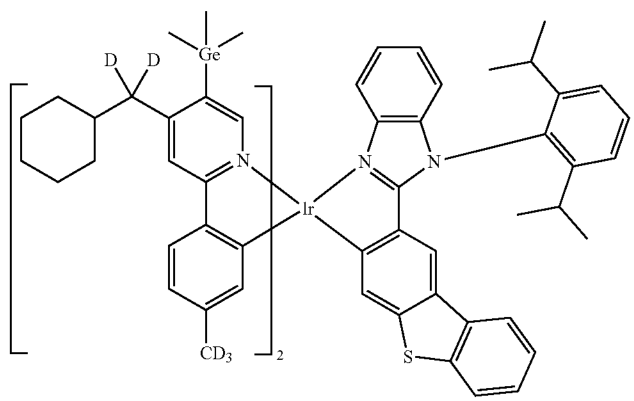
1252
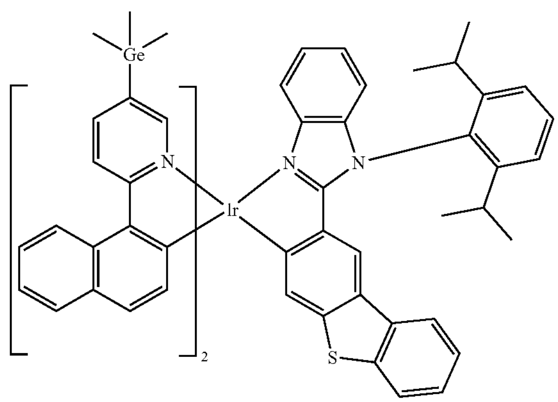

-continued
1253
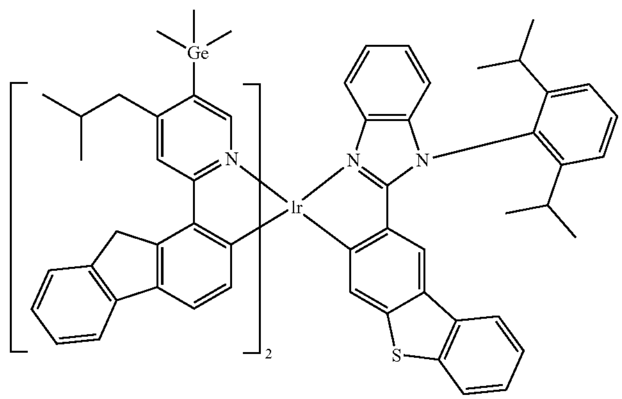
1254
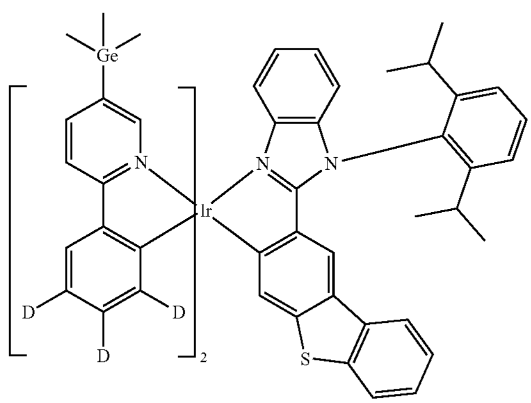
1255
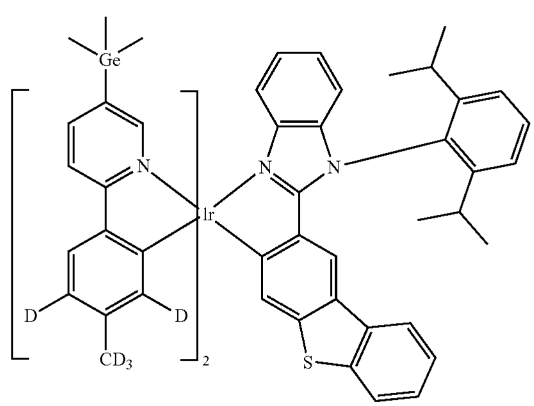
1256
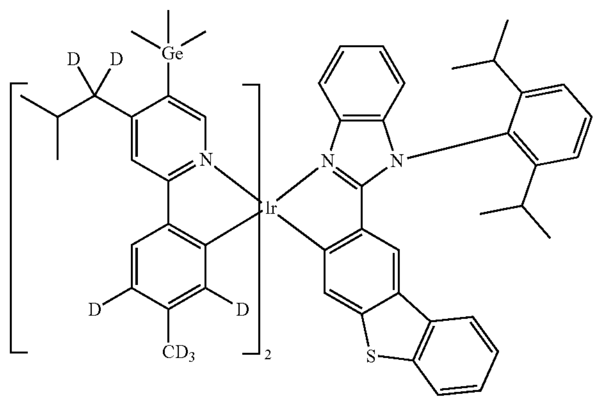
1257
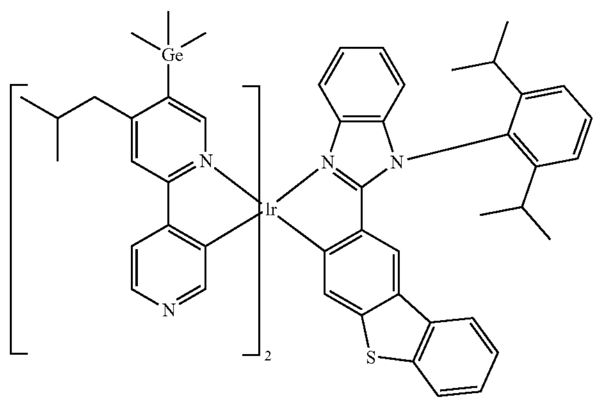

-continued
1258
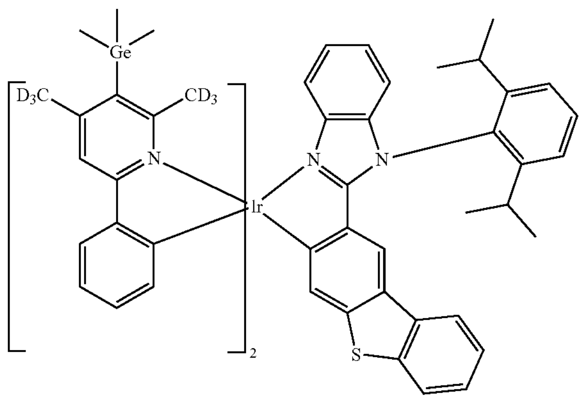
1259
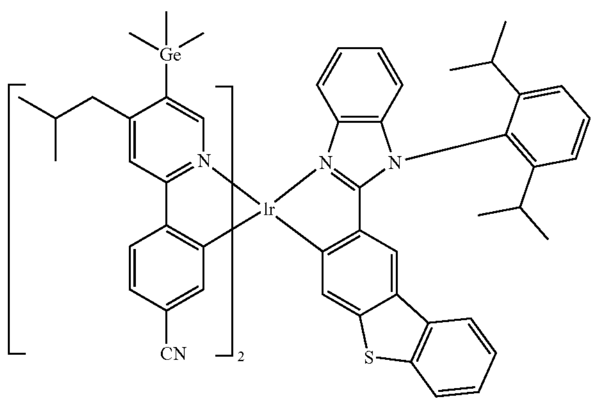
1260
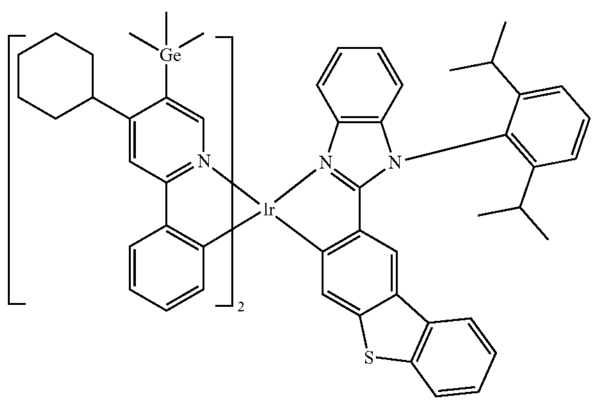
1261
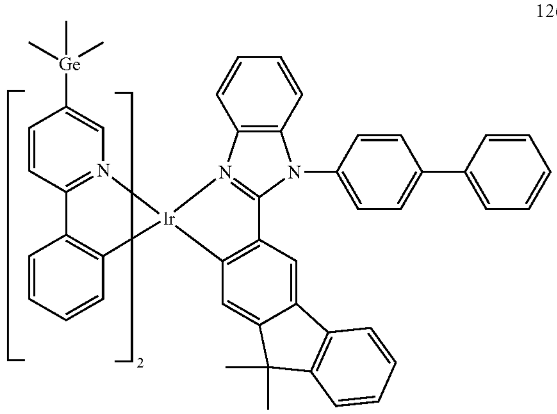
1262
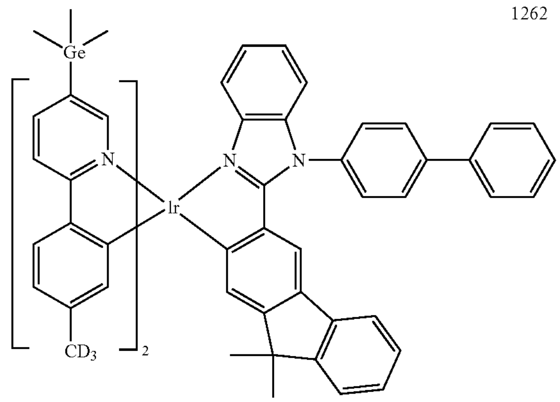

-continued
1263
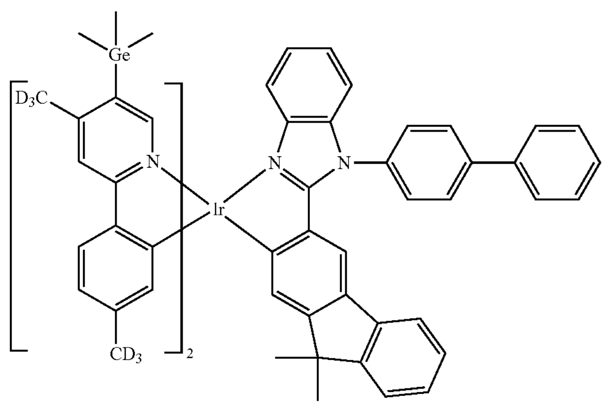
1264
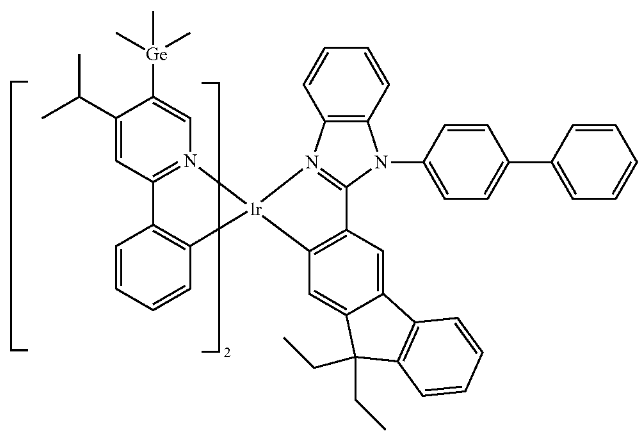
1265
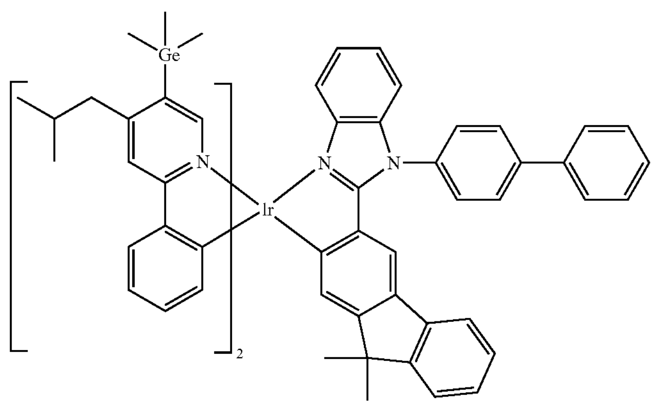

-continued
1266
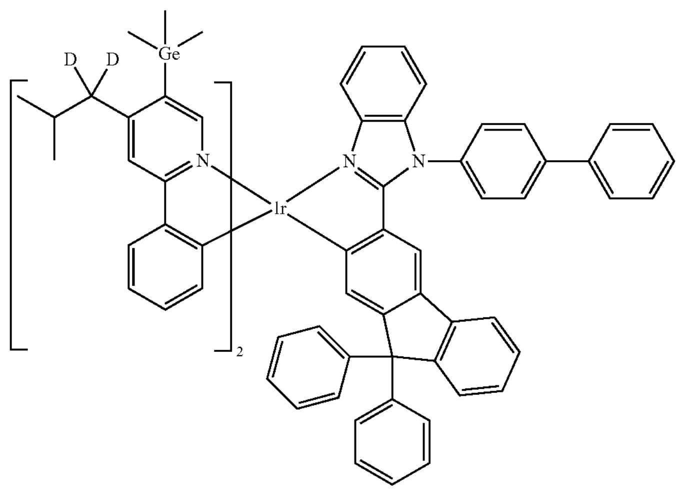
1267
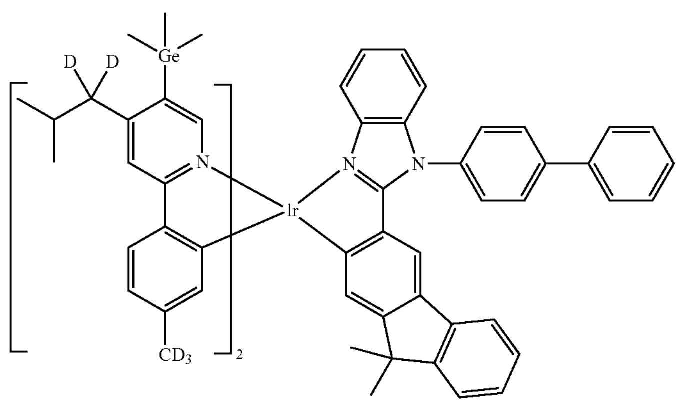
1268
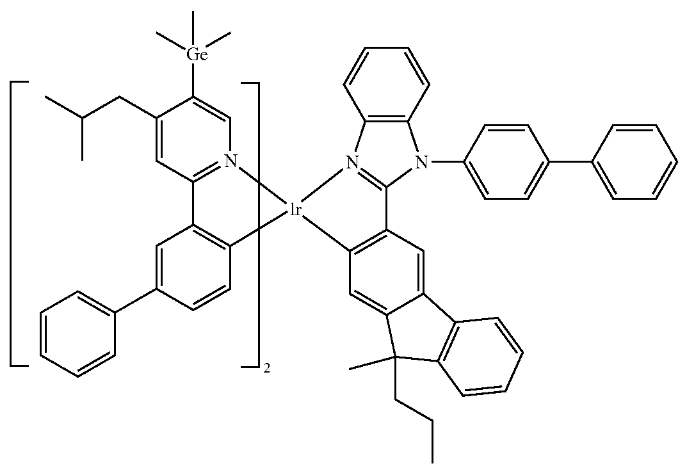

-continued
1269
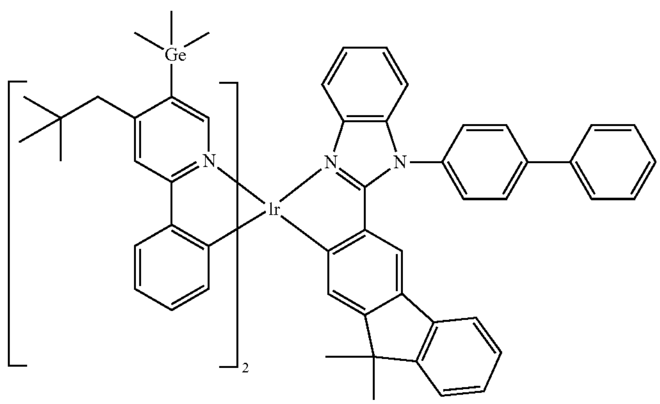
1270
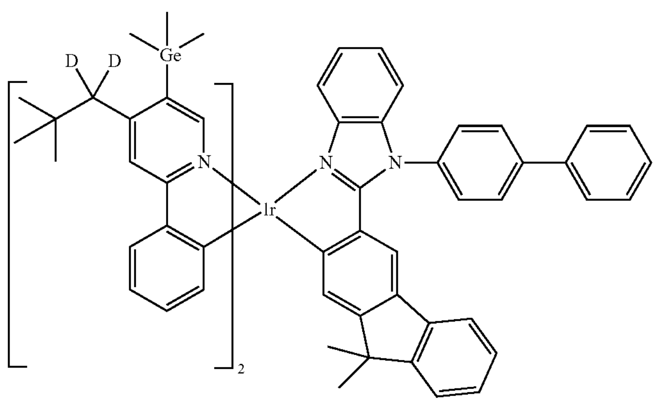
1271
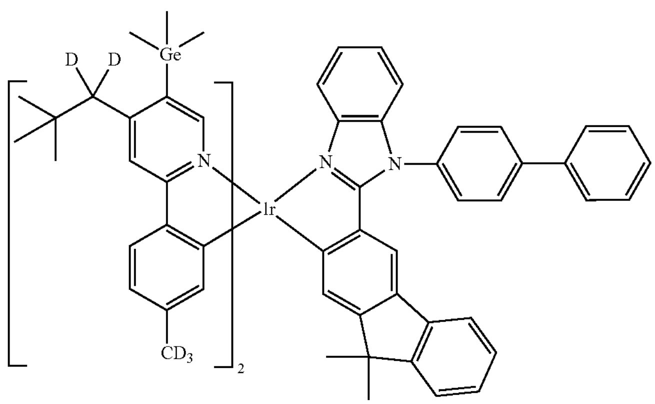
1272
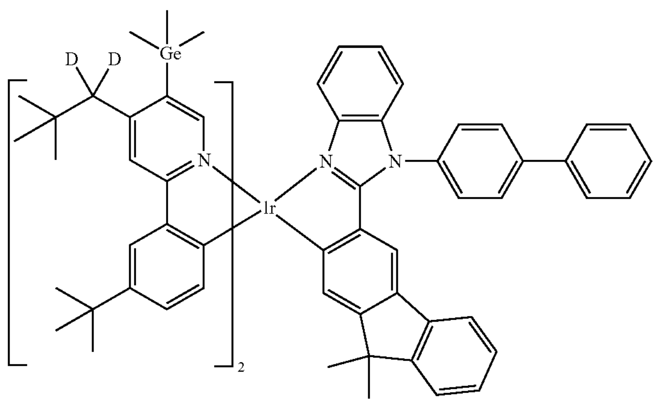

-continued
1273
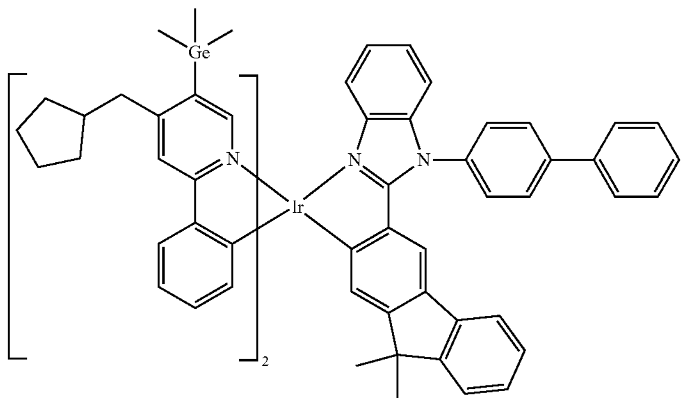
1274
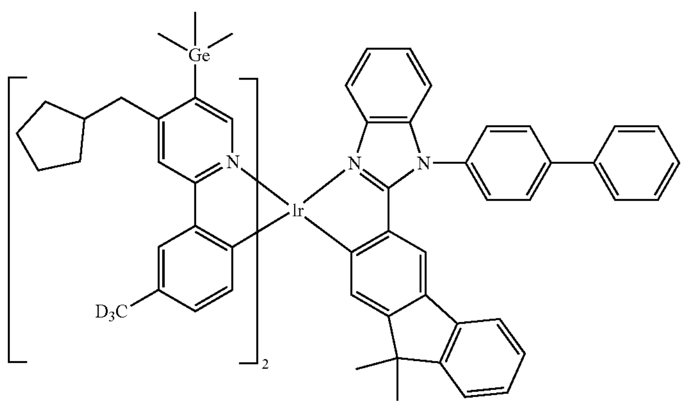
1275
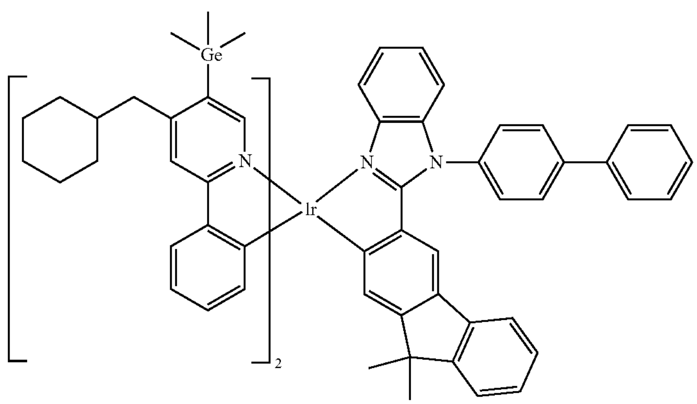
1276
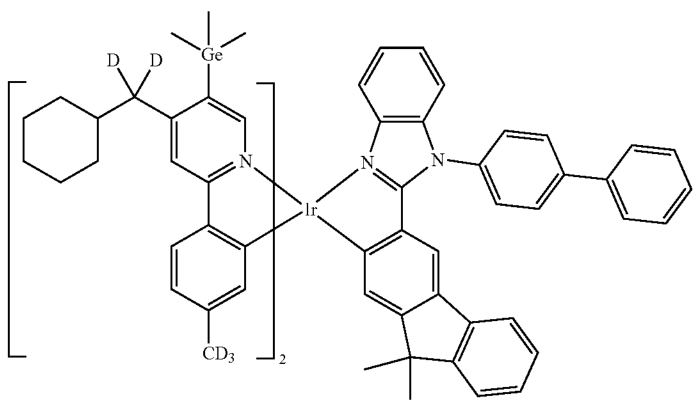

-continued
1277
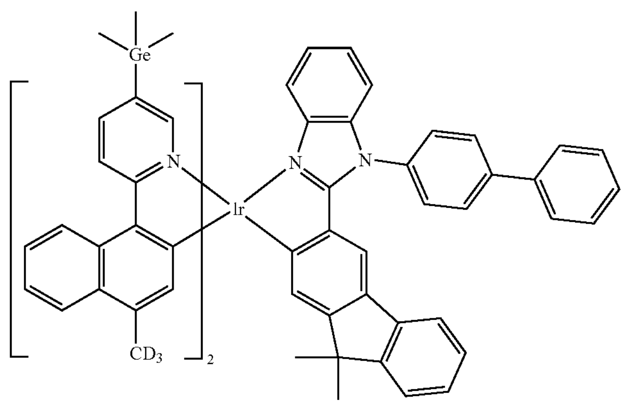
1278
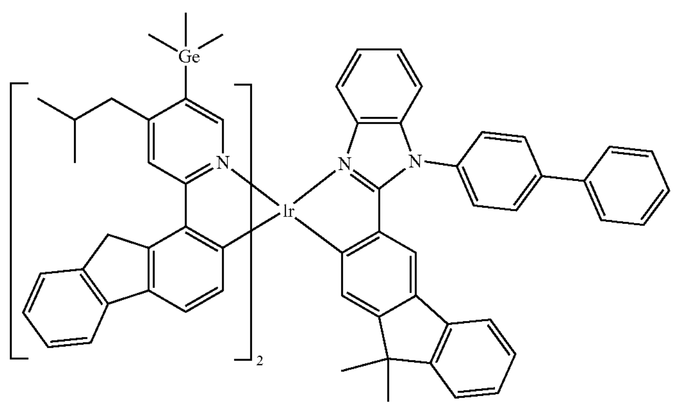
1279
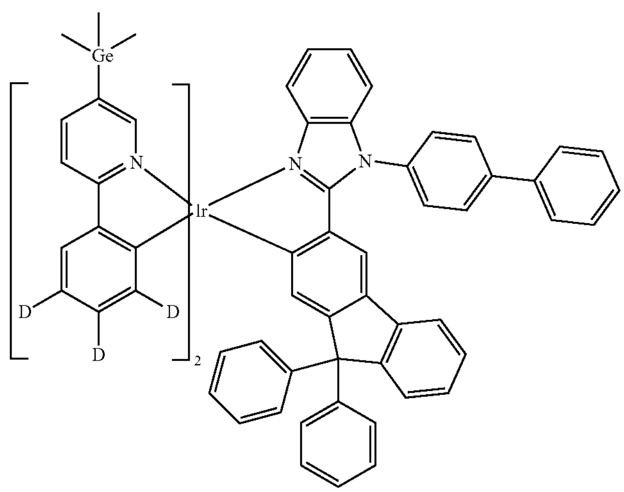

-continued
1280
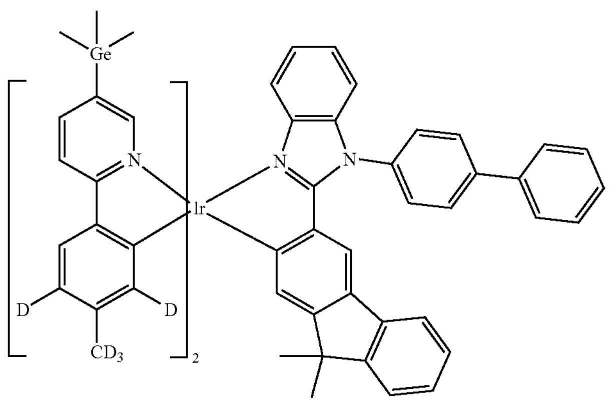
1281
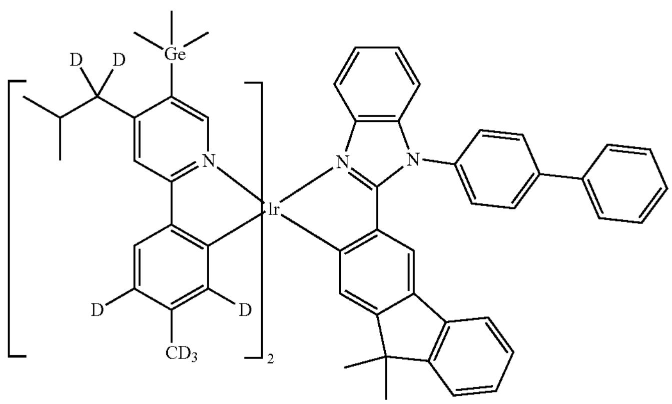
1282
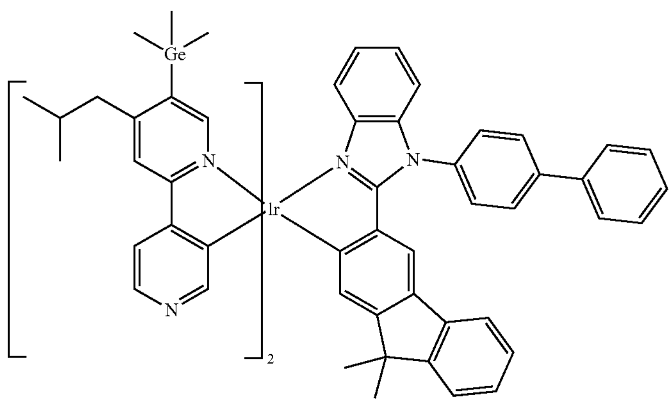
1283
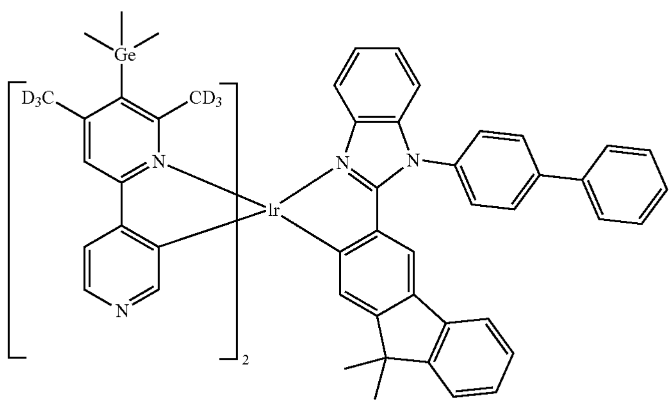

-continued
1284
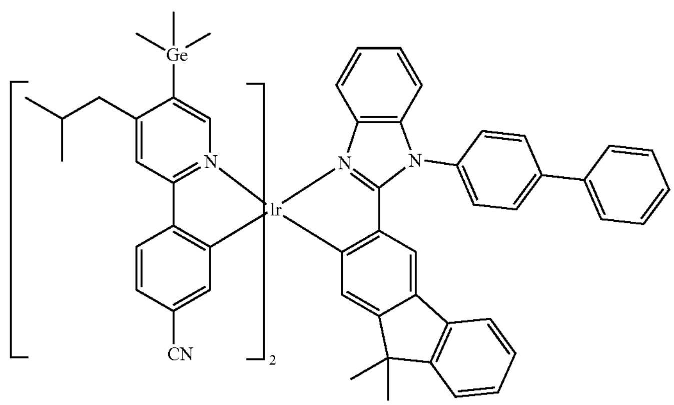
1285
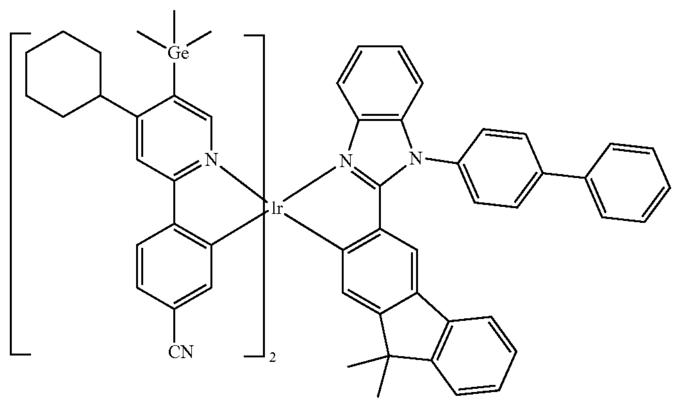
1286
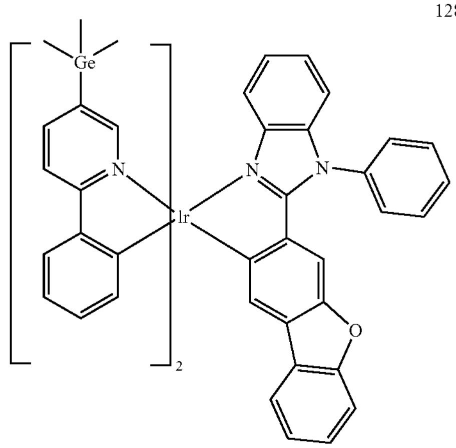
1287
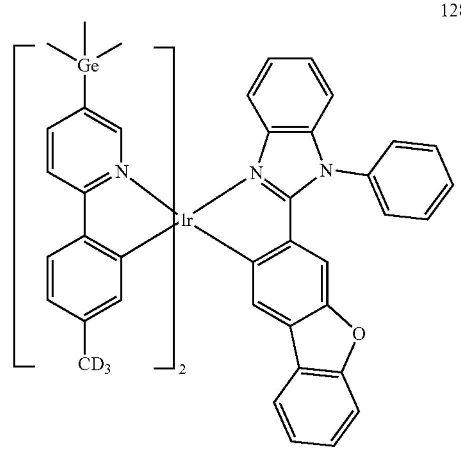

-continued
1288
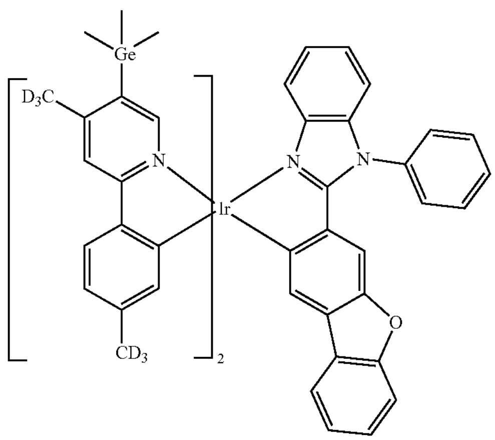
1289
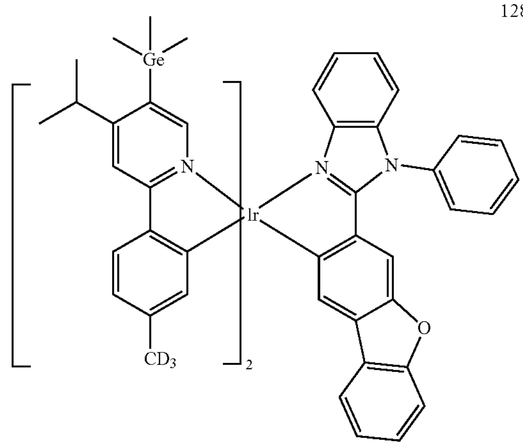
1290
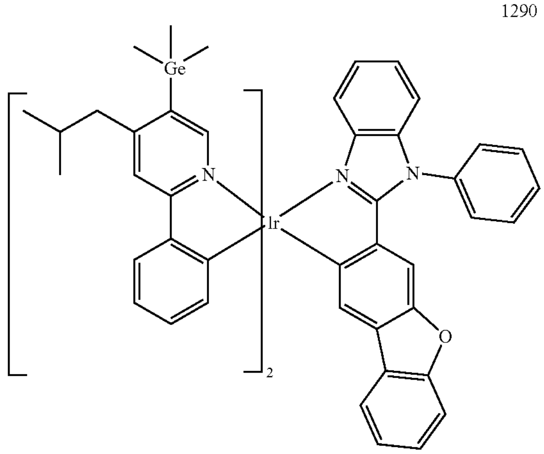
1291
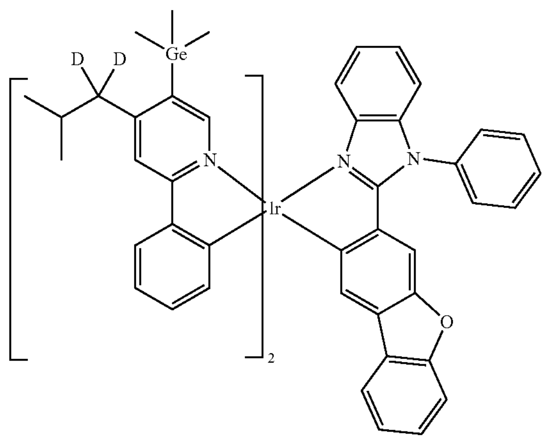
1292
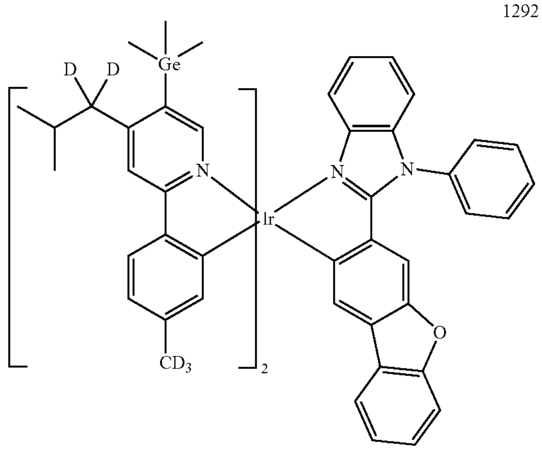
1293
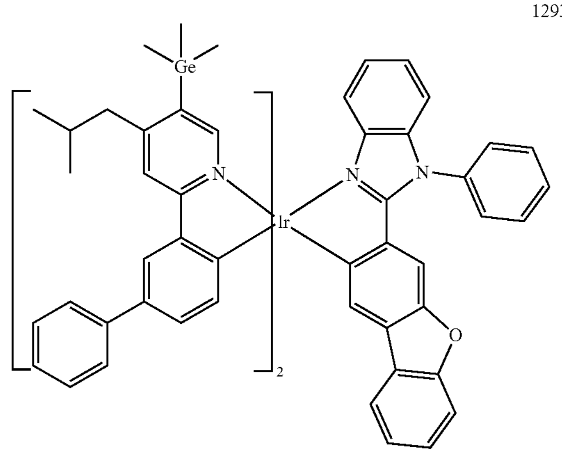

-continued
1294
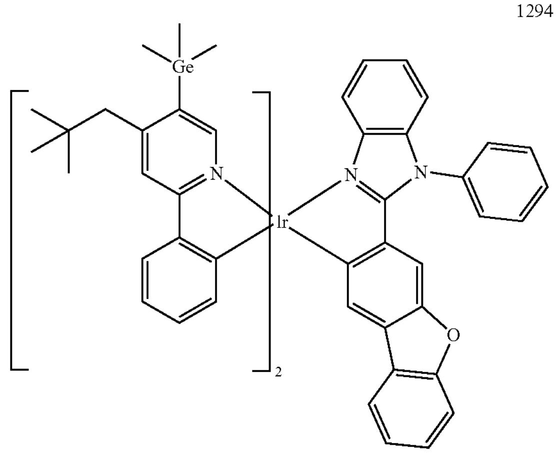
1295
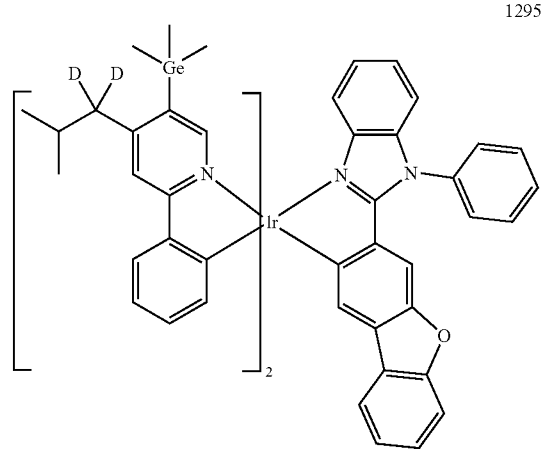
1296
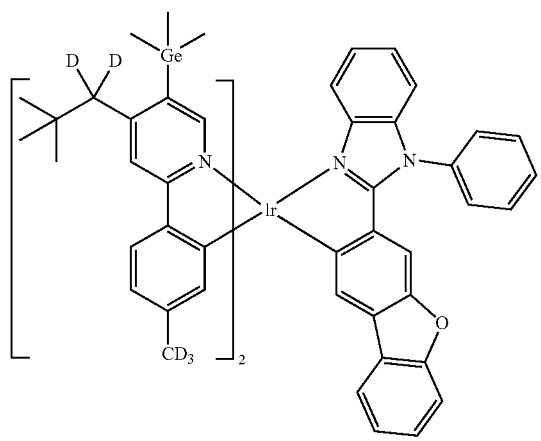
1297
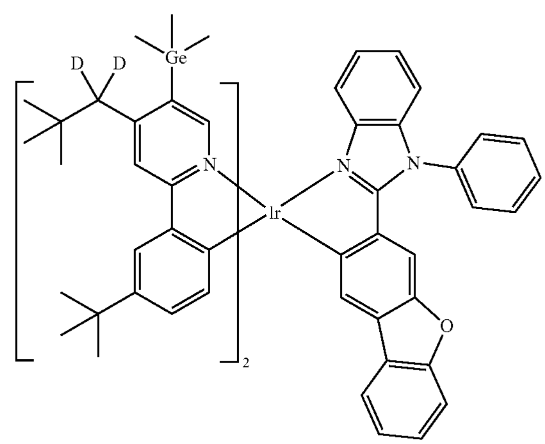
1298
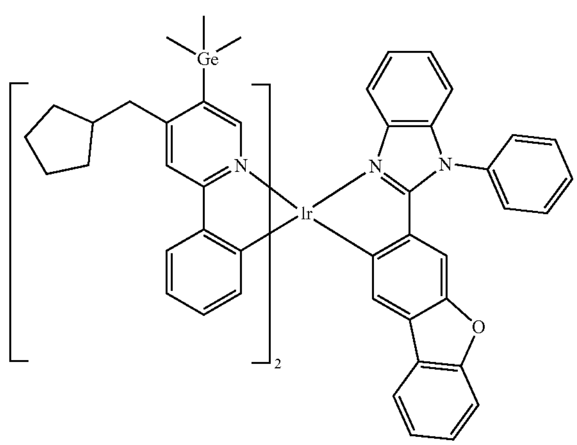
1299
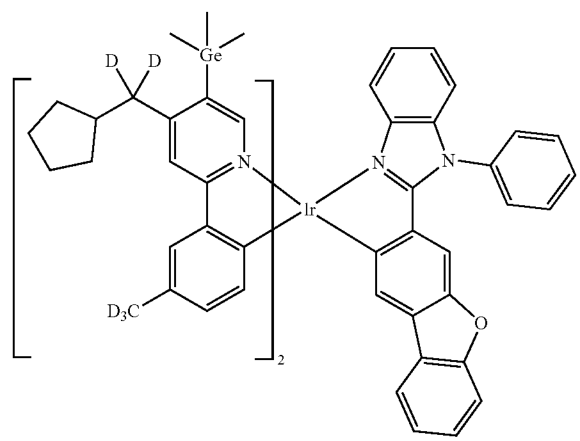

-continued
1300
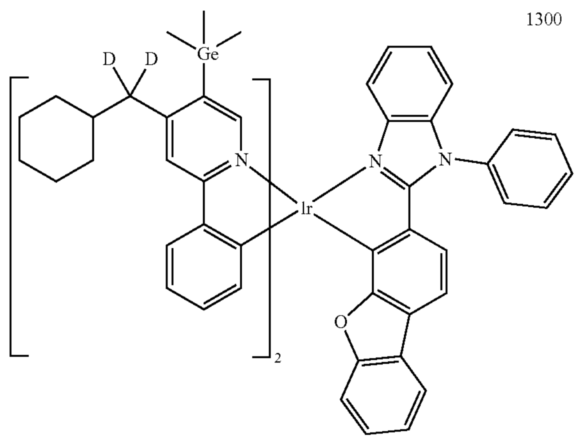
1301
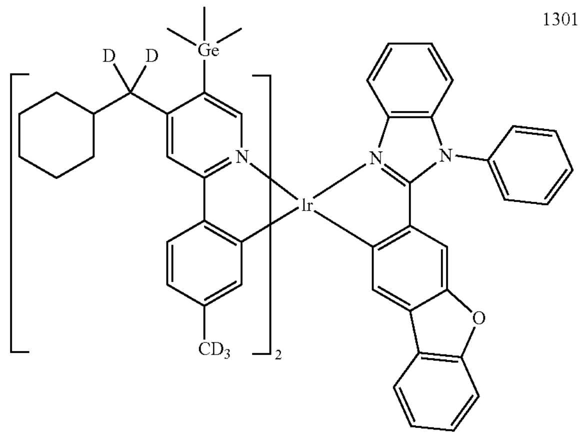
1302
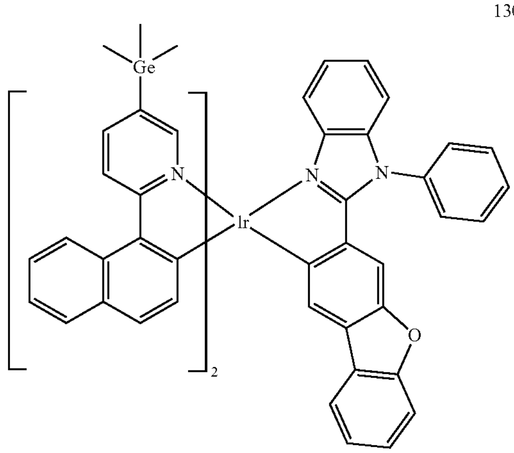
1303
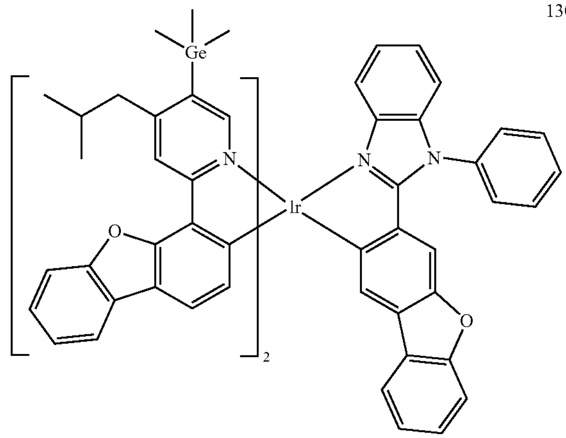
1304
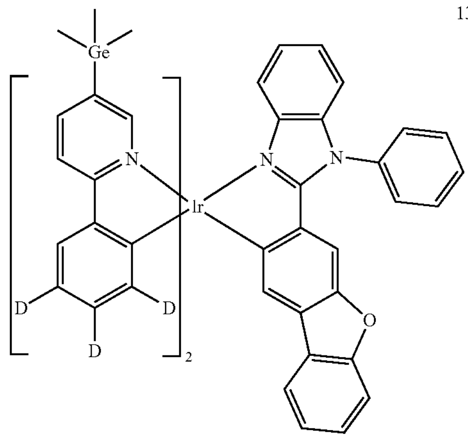
1305
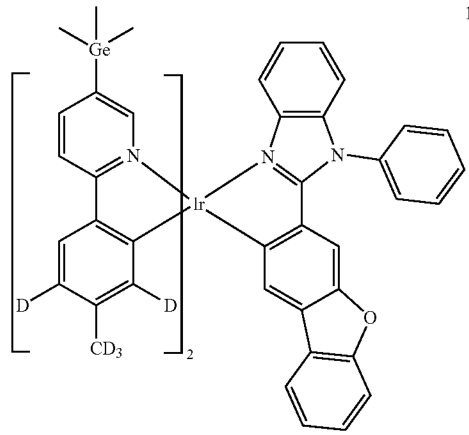

-continued
1306
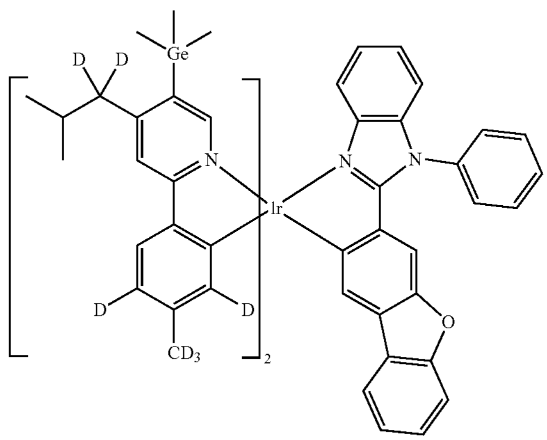
1307
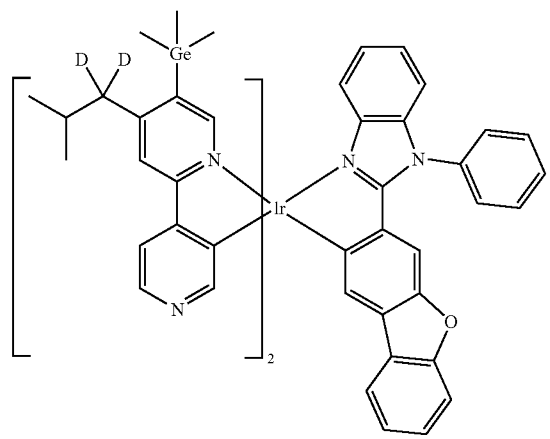
1308
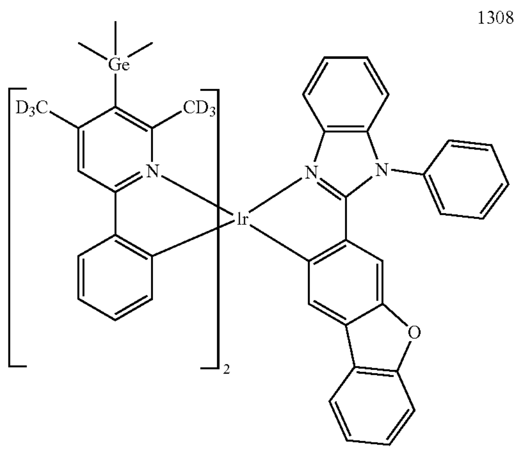
1309
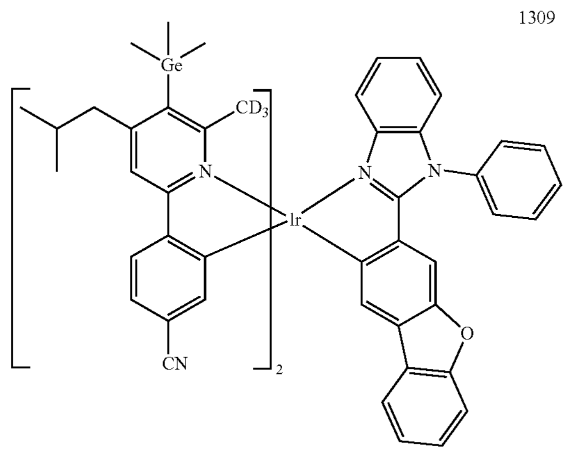
1310
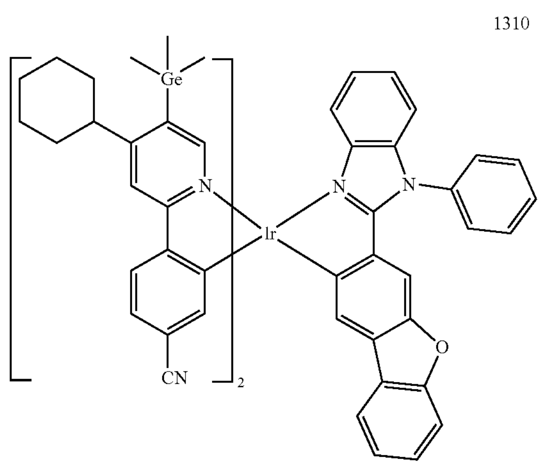
1311
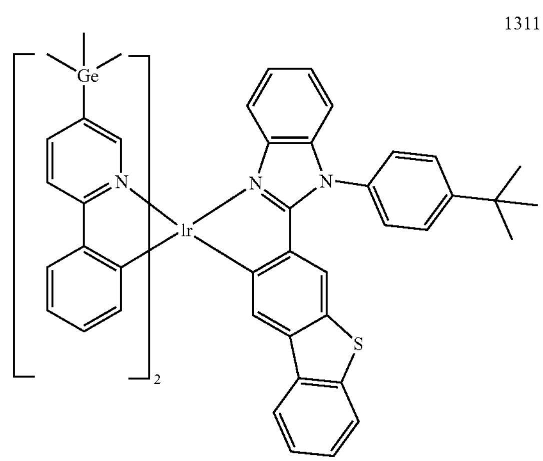

-continued
1312
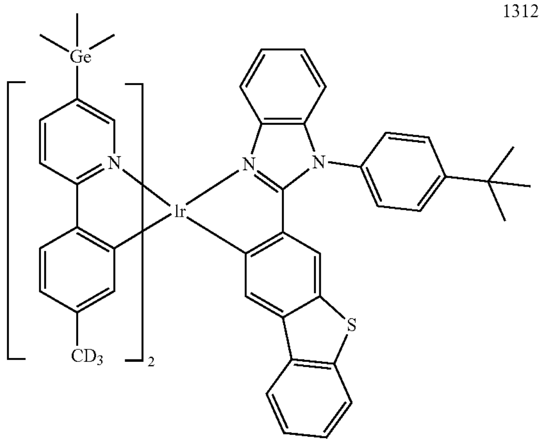
1313
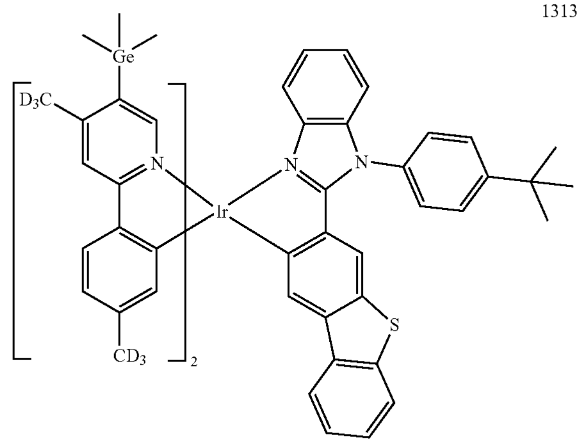
1314
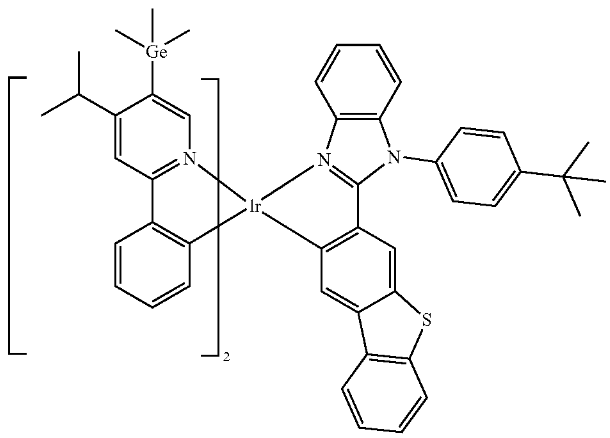
1315
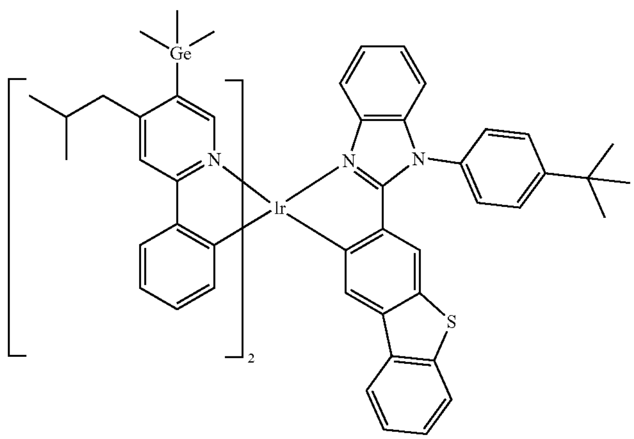

-continued
1316
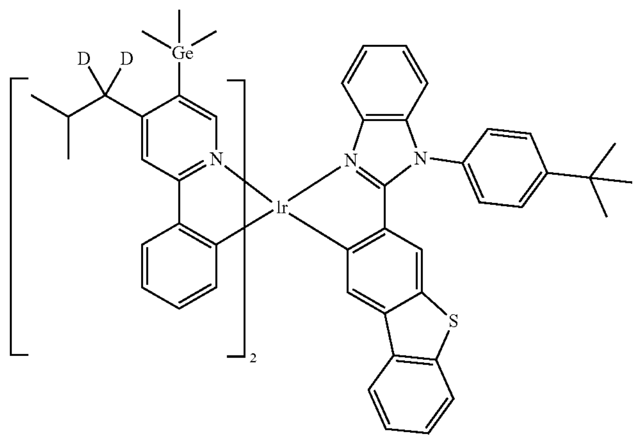
1317
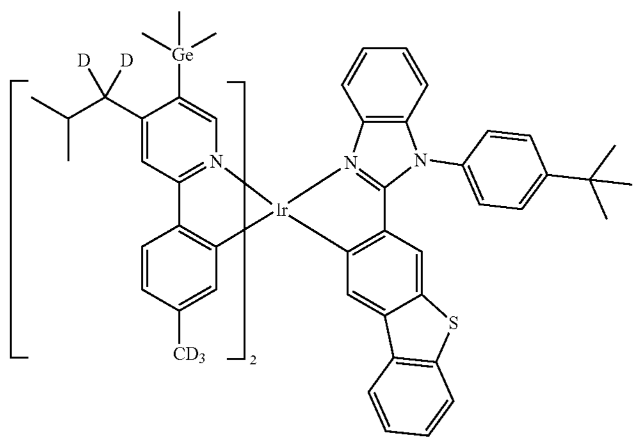
1318
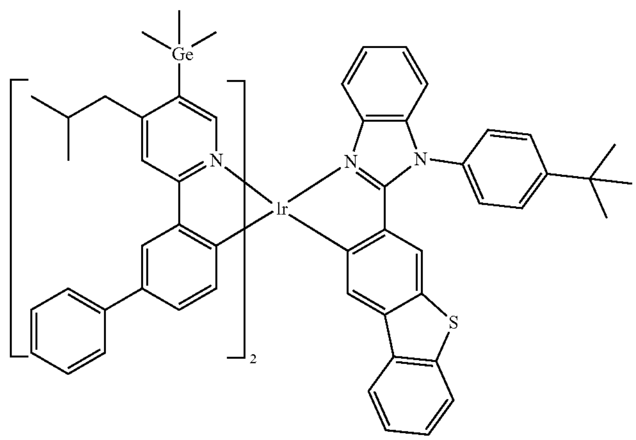

-continued
1319
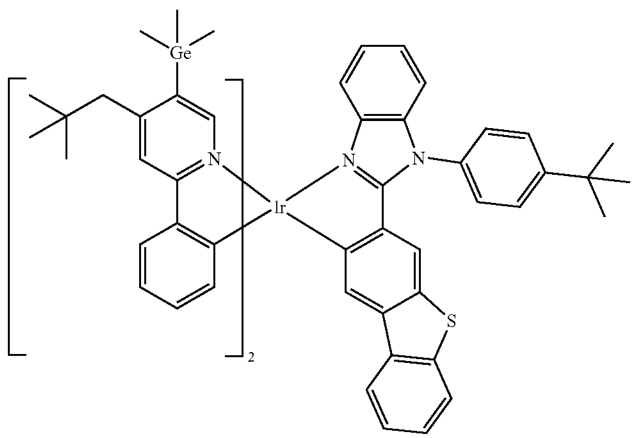
1320
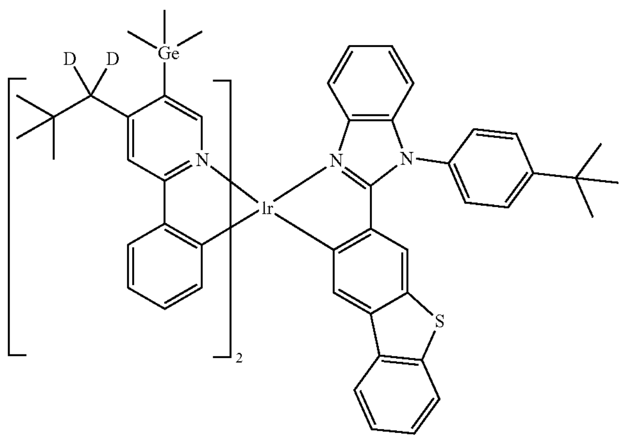
1321
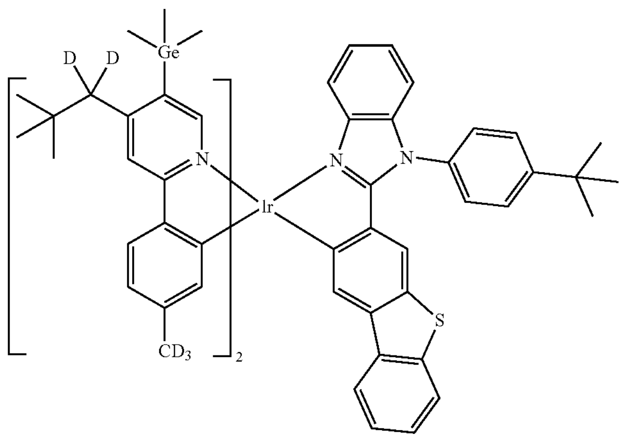

-continued
1322
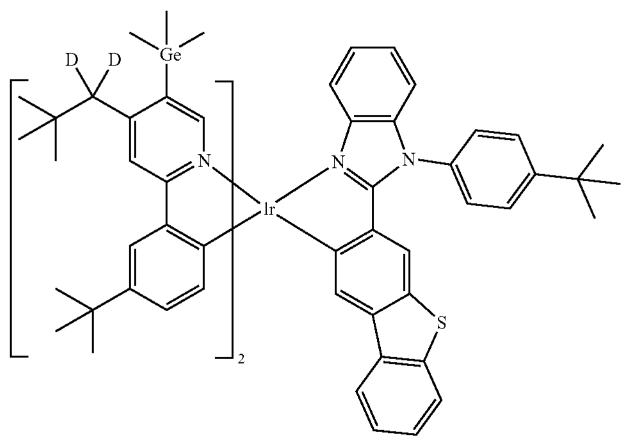
1323
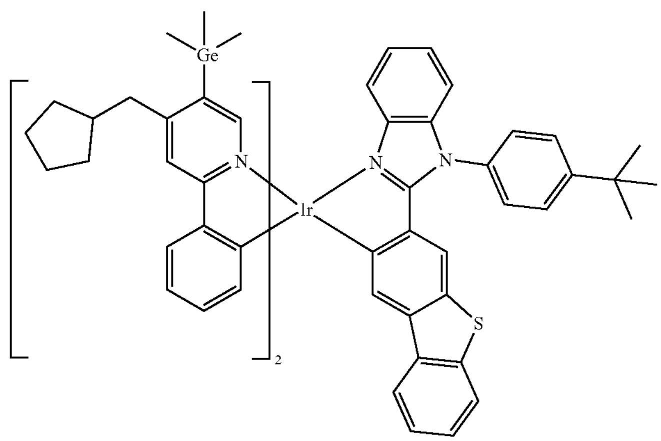
1324
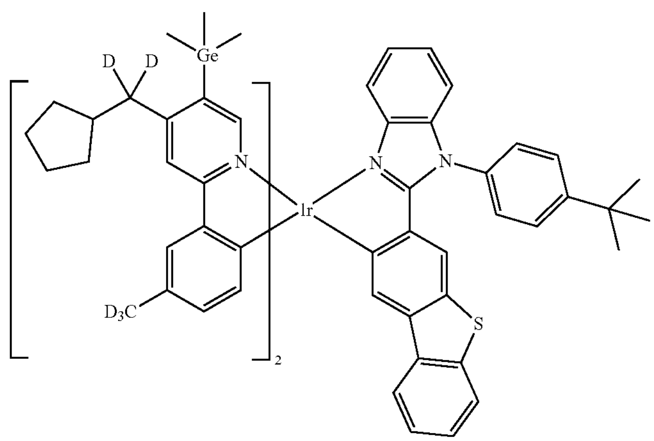

-continued
1325
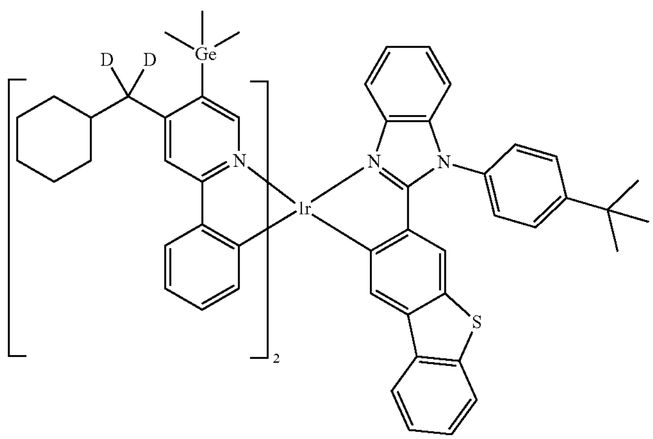
1326
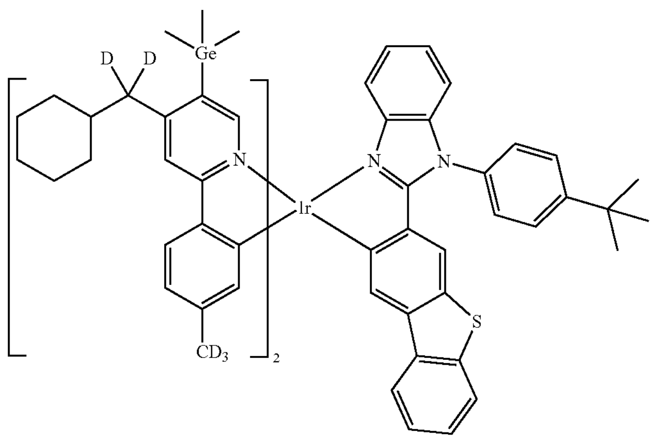
1327
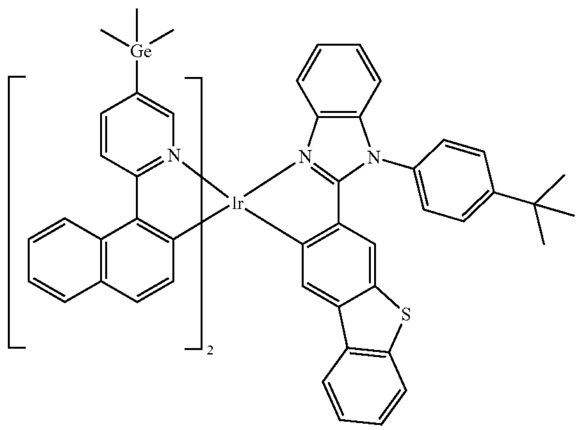

-continued
1328
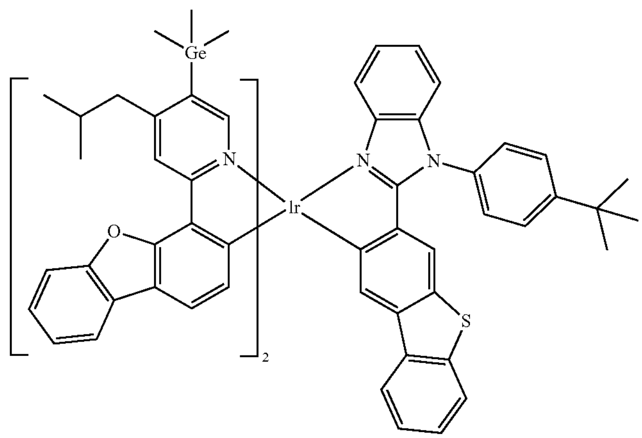
1329
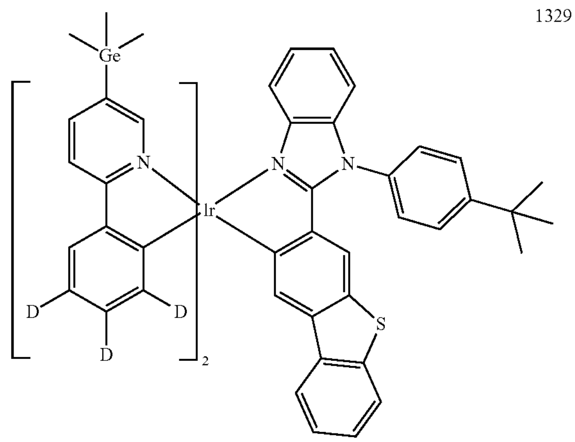
1330
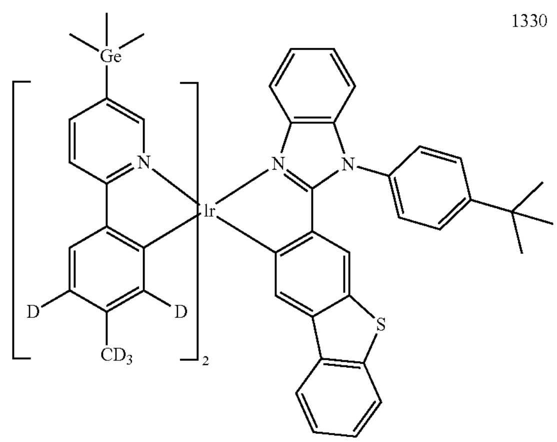
1331
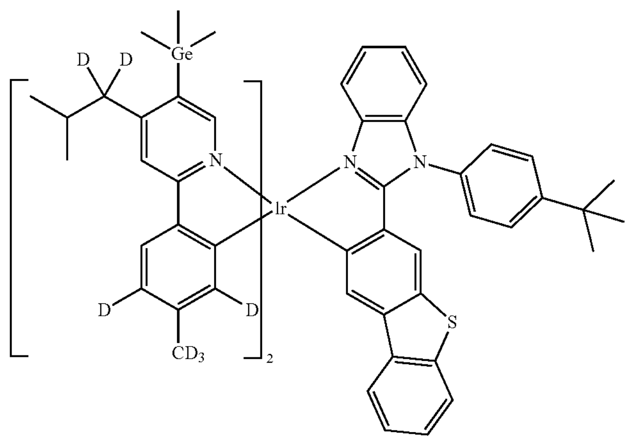

-continued
1332
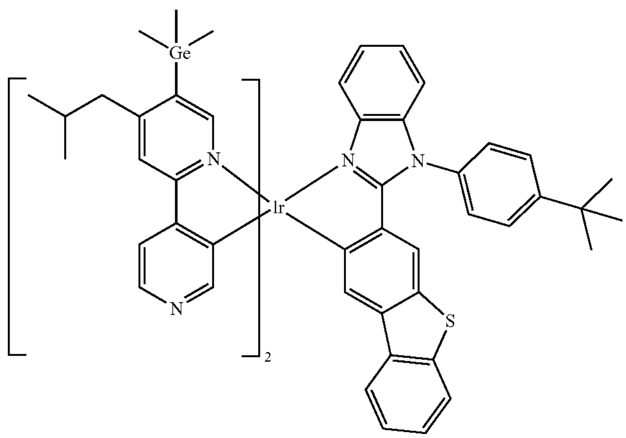
1333
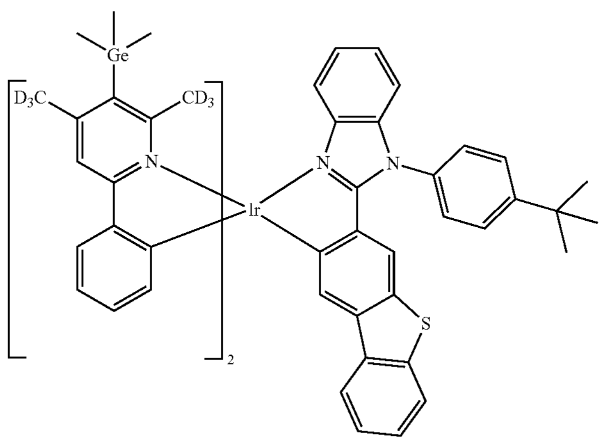
1334
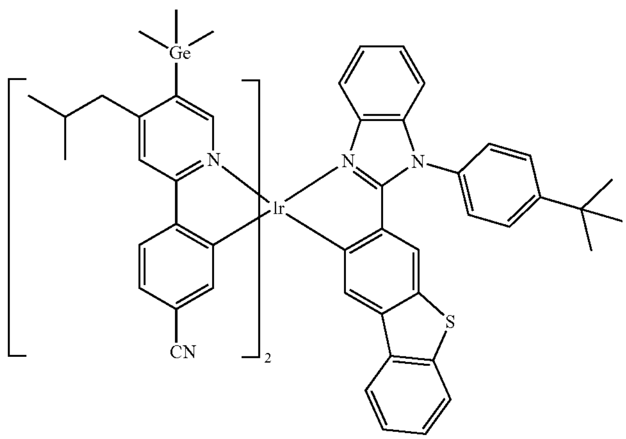

-continued
1335
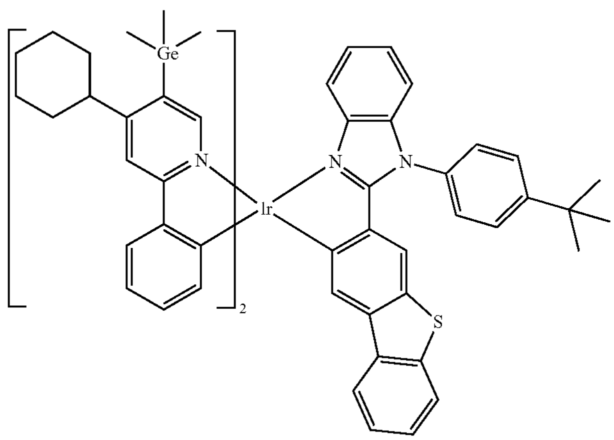
1336
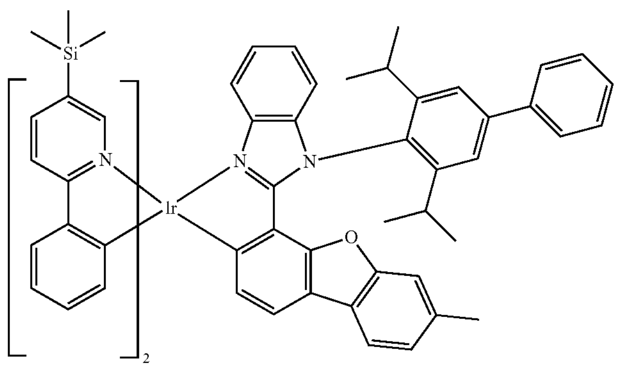
1337
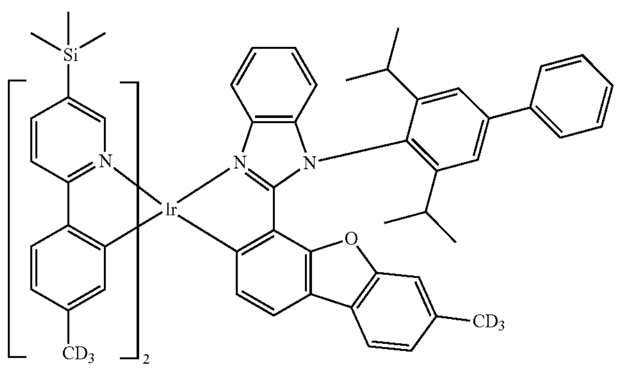
1338
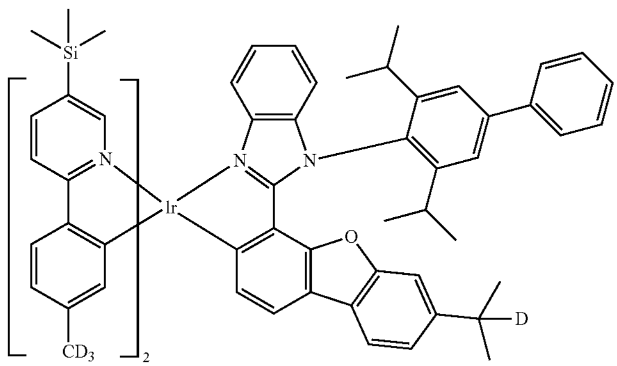

-continued
1339
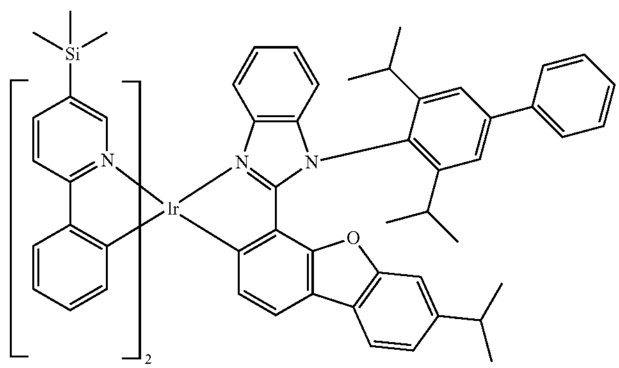
1340
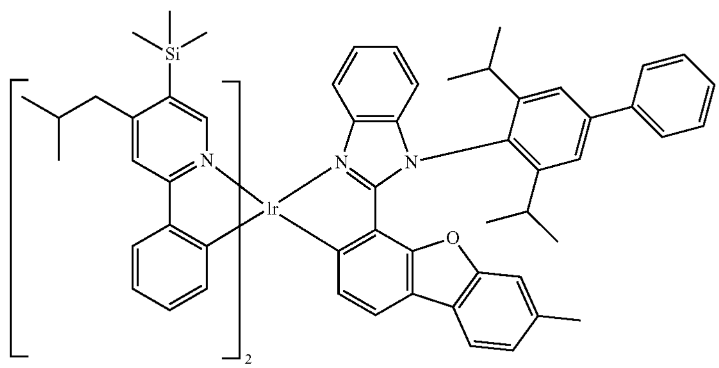
1341
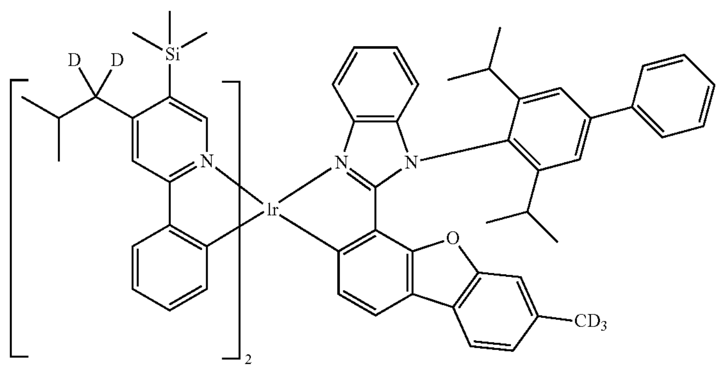
1342
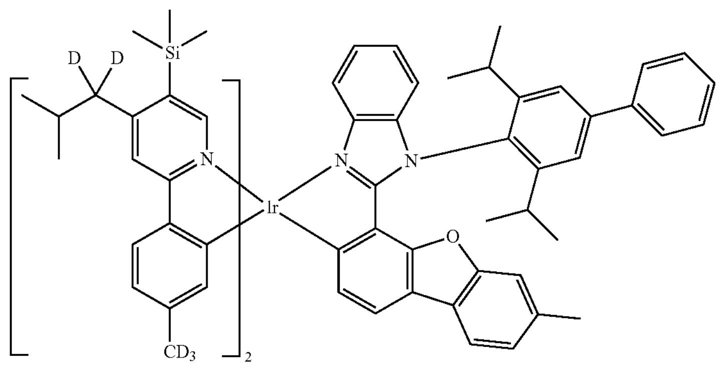

-continued
1343
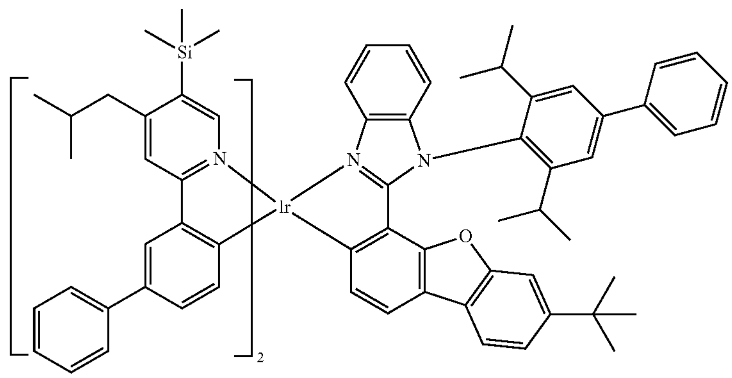
1344
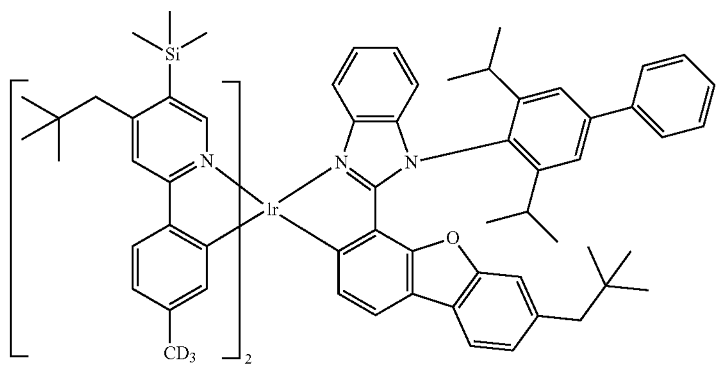
1345
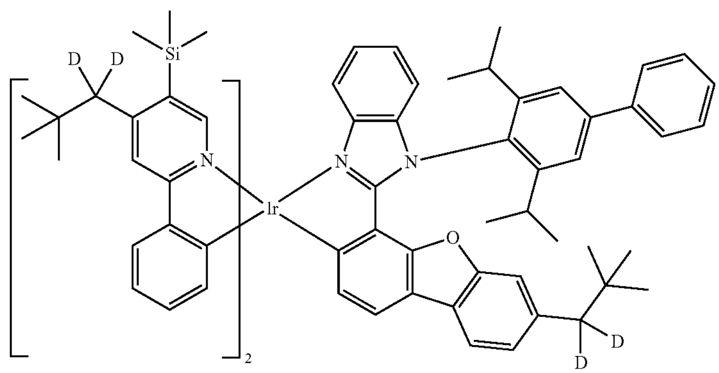
1346
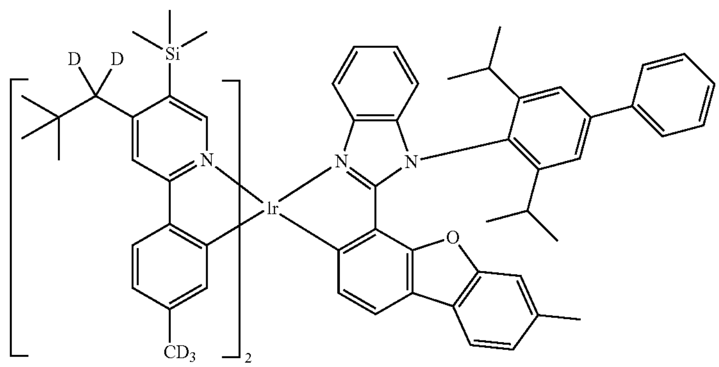

-continued
1347
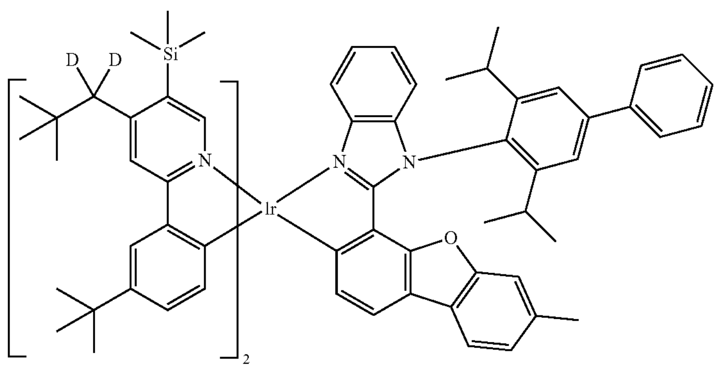
1348
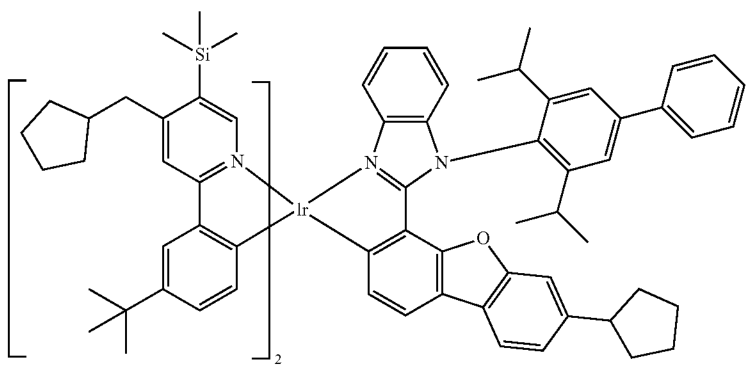
1349
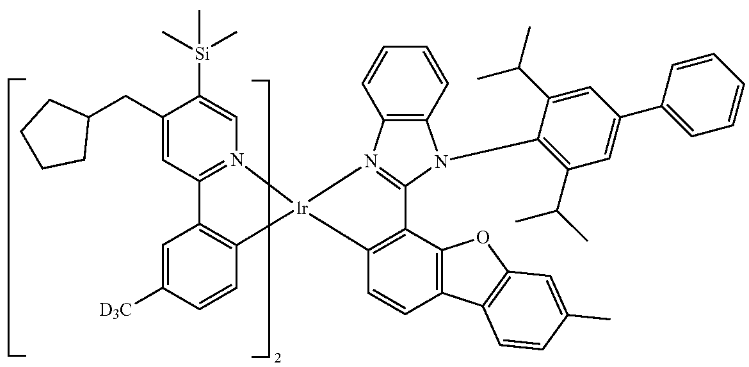
1350
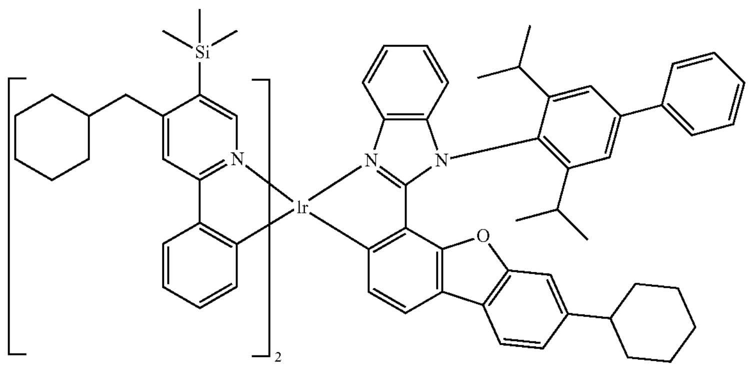

-continued
1351
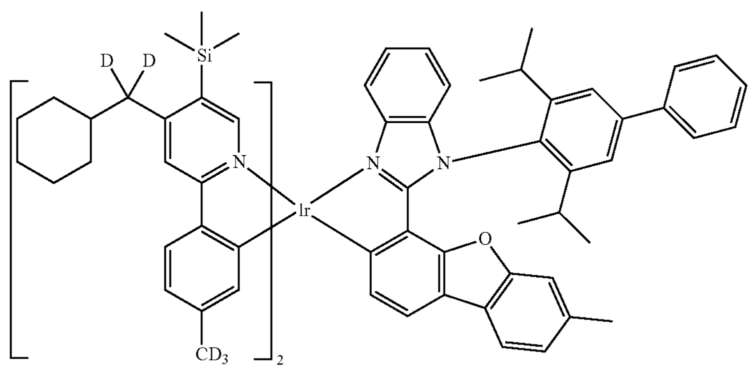
1352
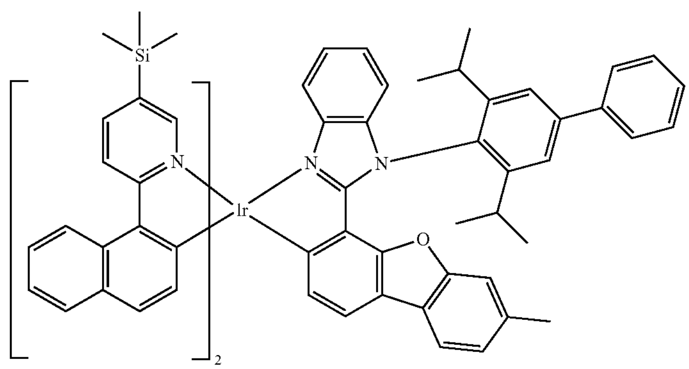
1353
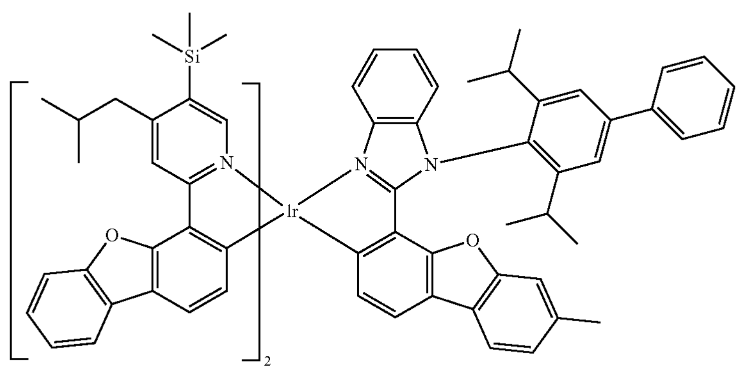
1354
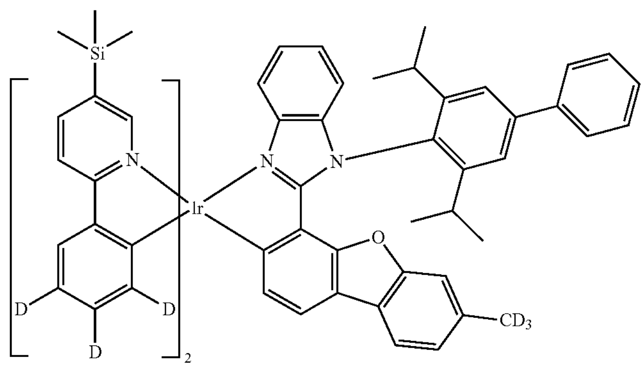

-continued
1355
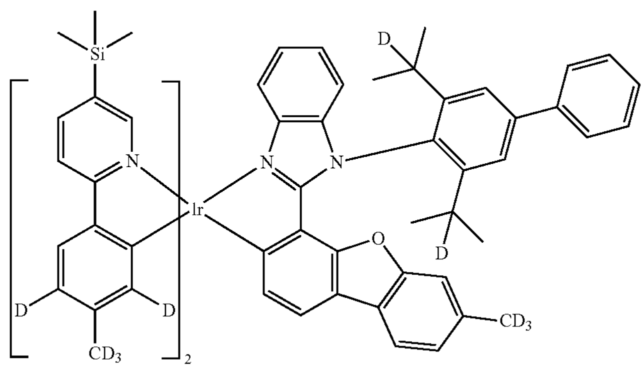
1356
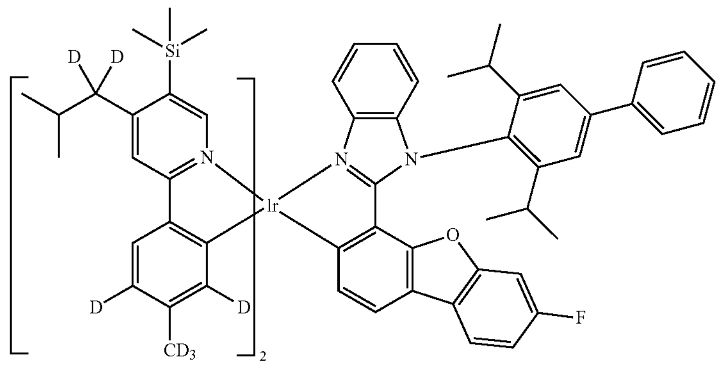
1357
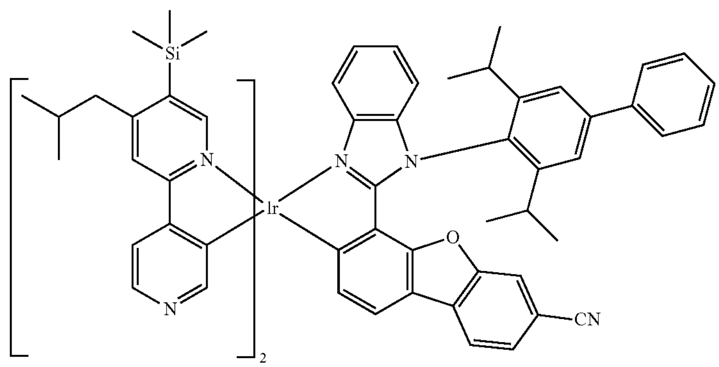
1358
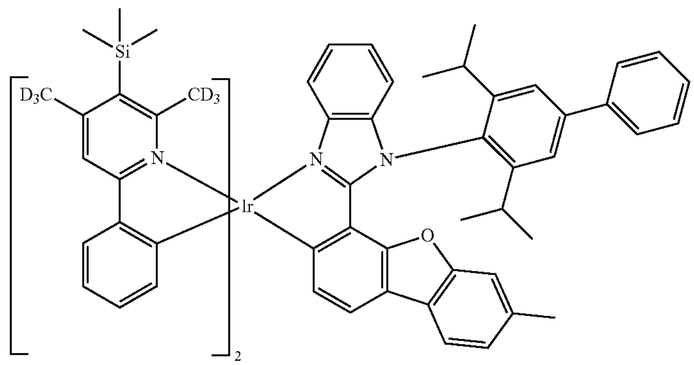

-continued
1359
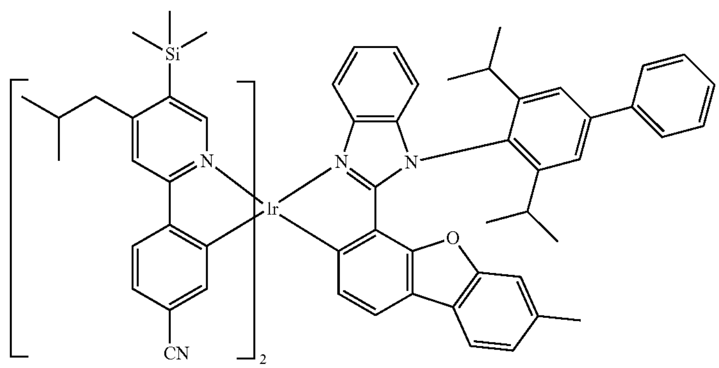
1360
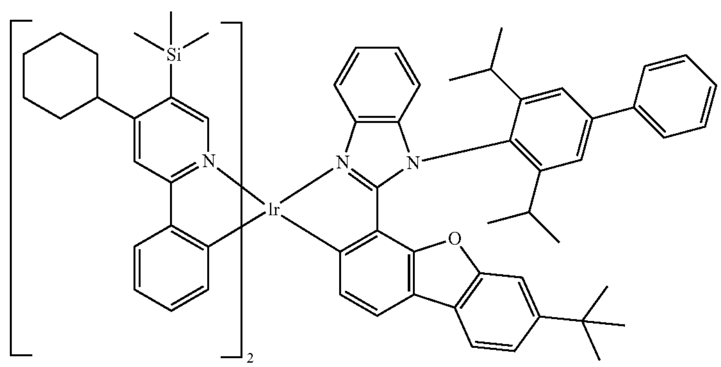
1361
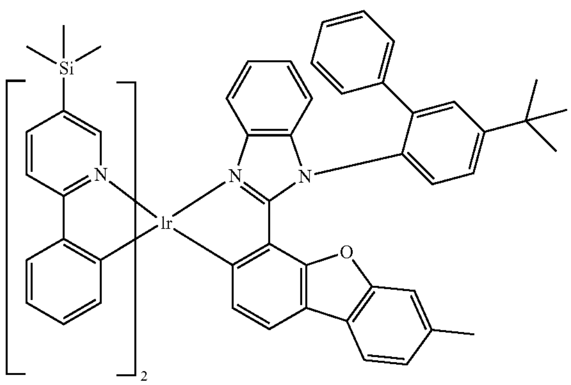
1362
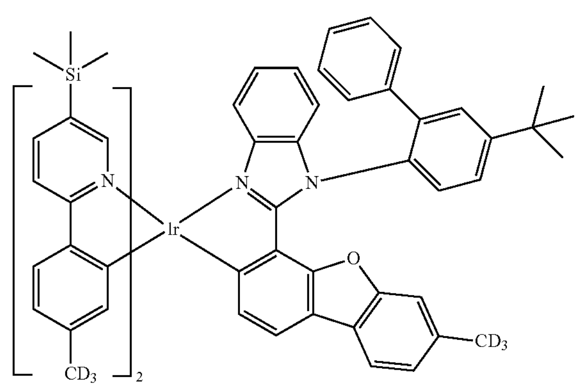
1363
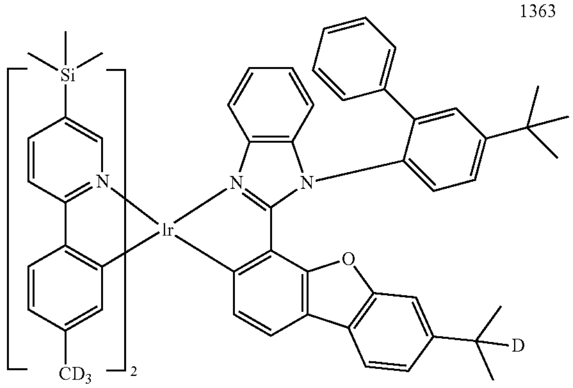
1364
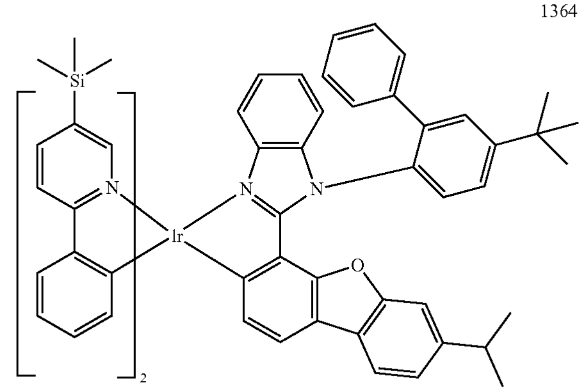

-continued
1365
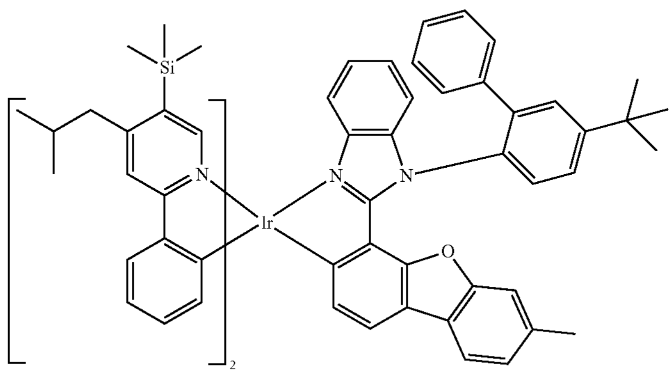
1366
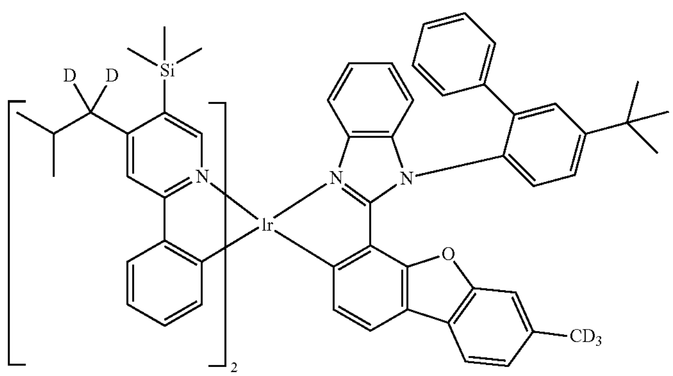
1367
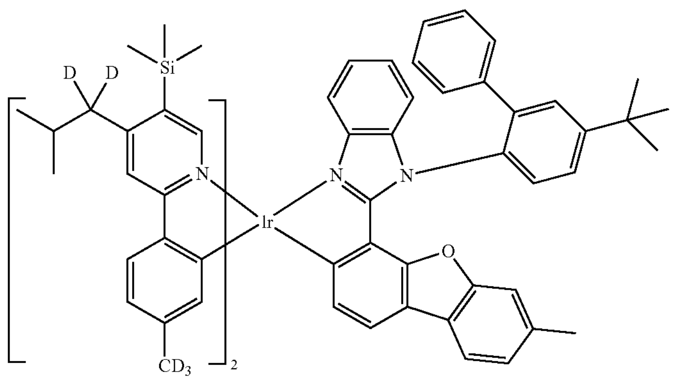
1368
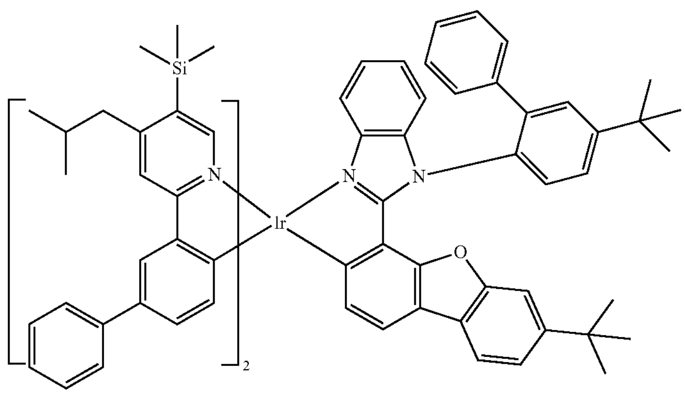

-continued
1369
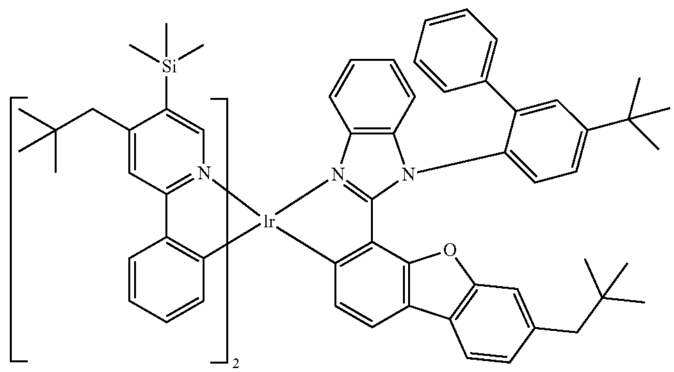
1370
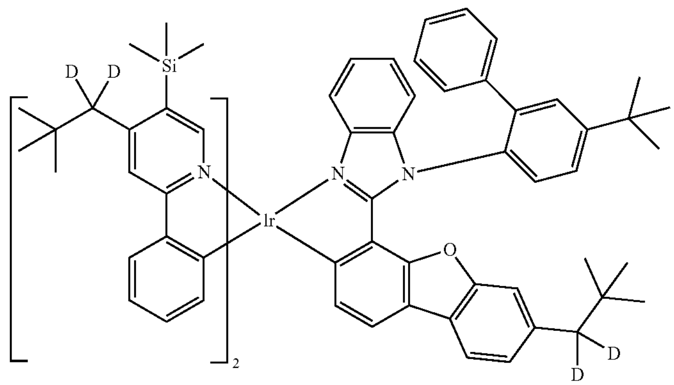
1371
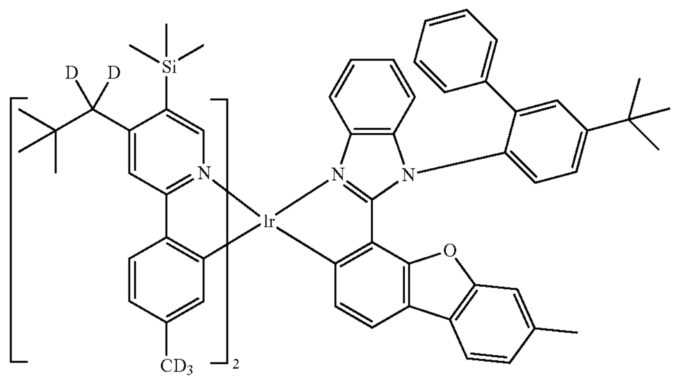
1372
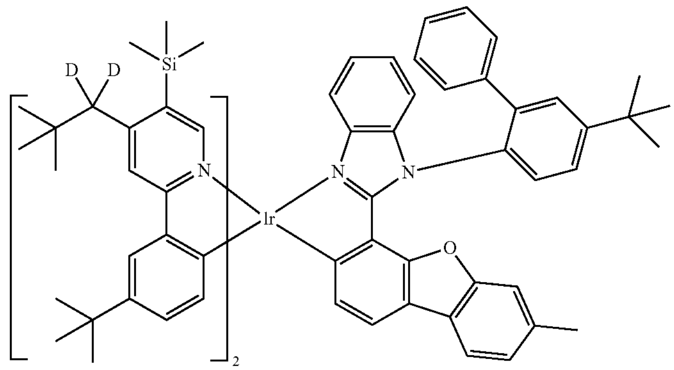

-continued
1373
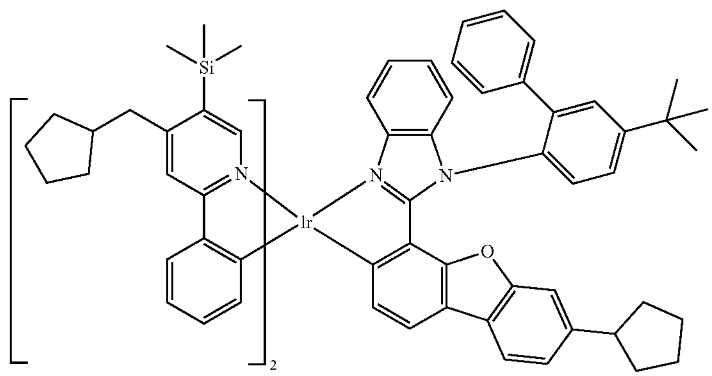
1374
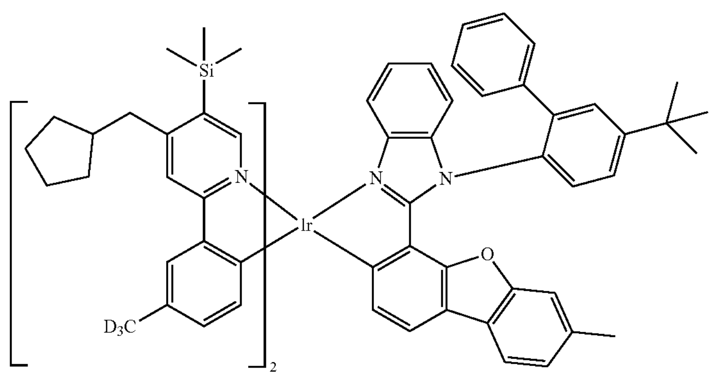
1375
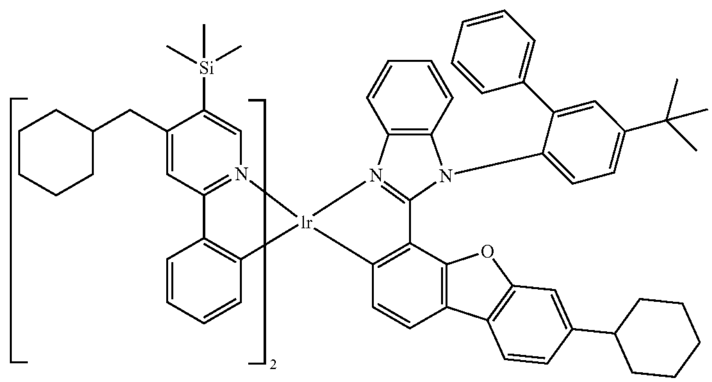
1376
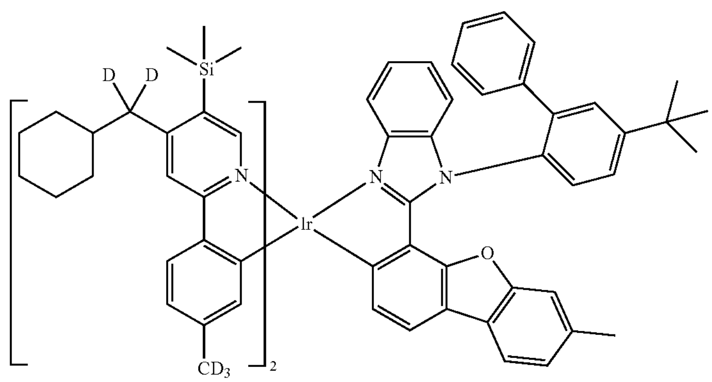

-continued
1377
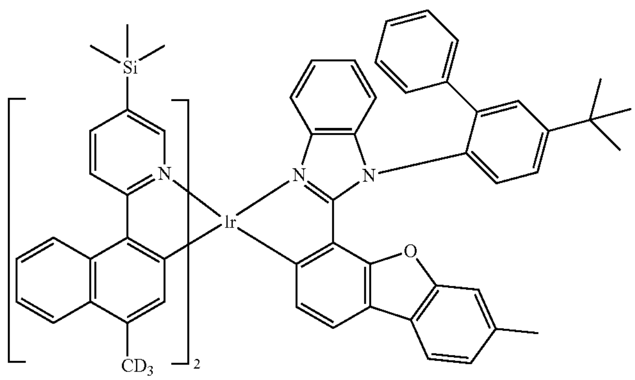
1378
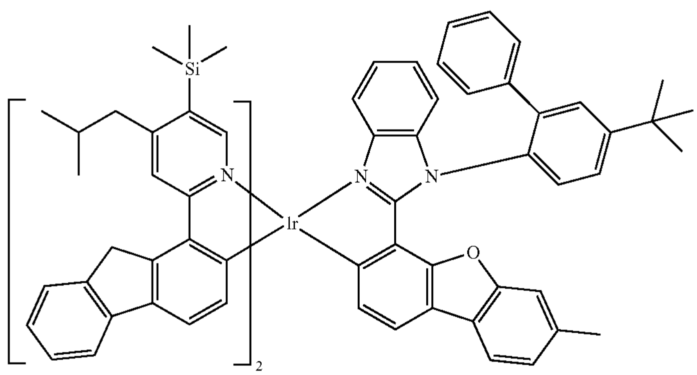
1379
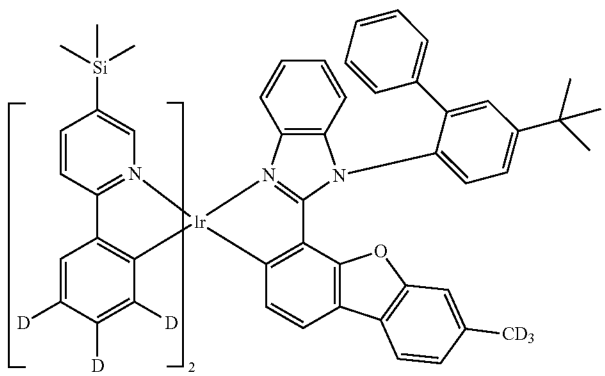
1380
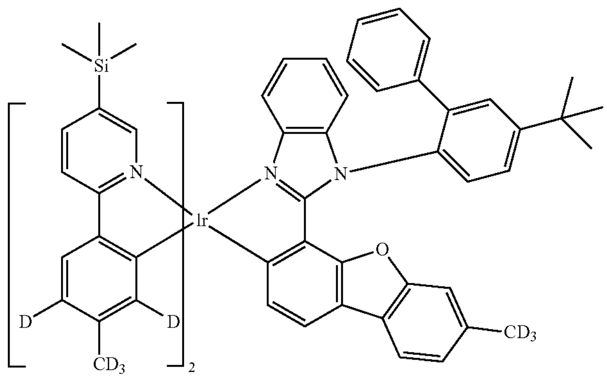

-continued
1381
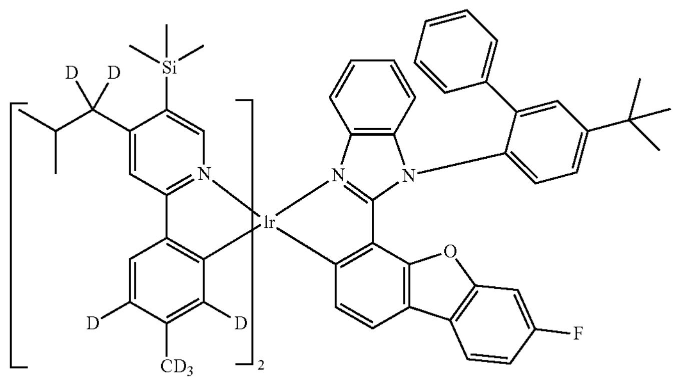
1382
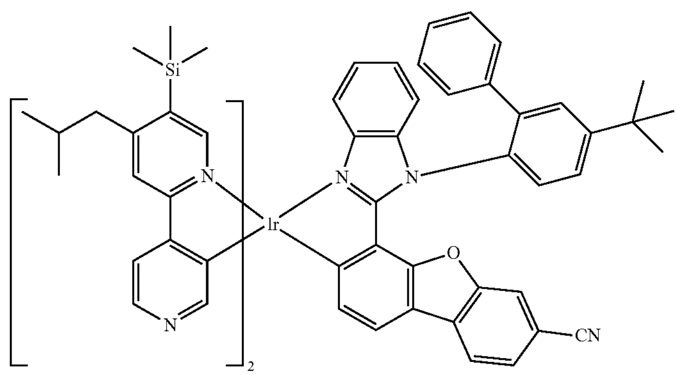
1383
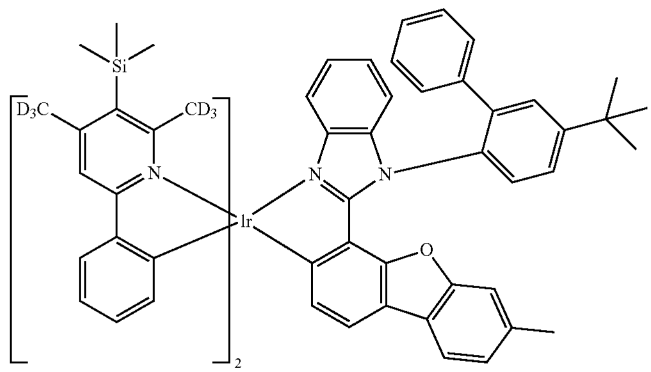
1384
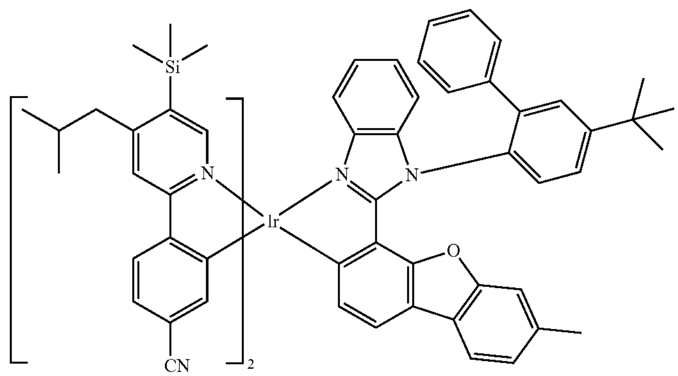

-continued
1385
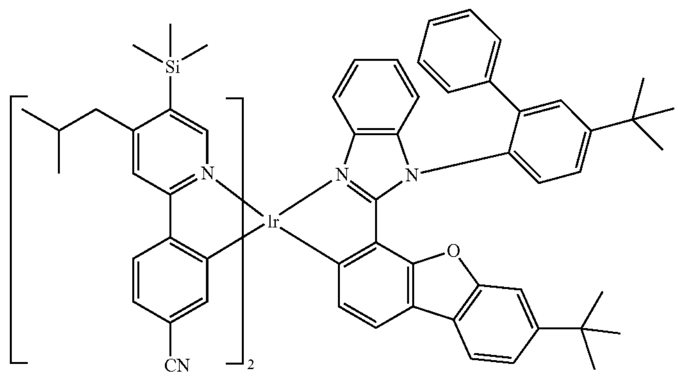
1386
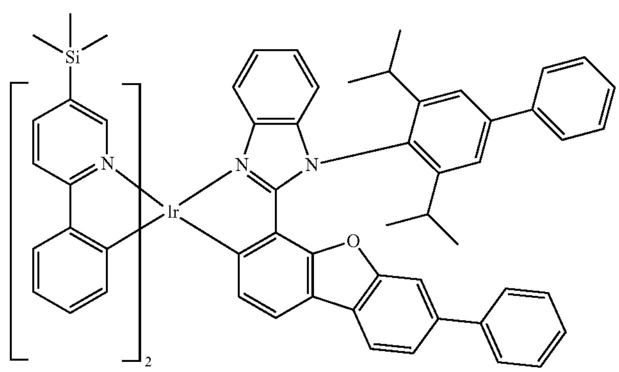
1387
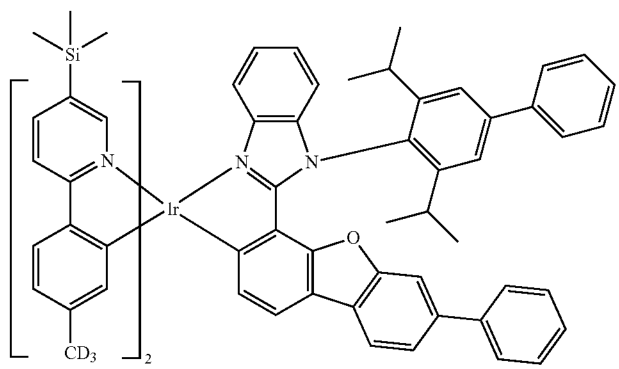
1388
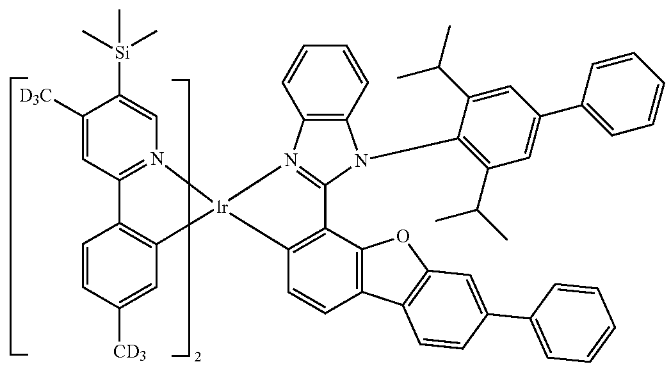

-continued
1389
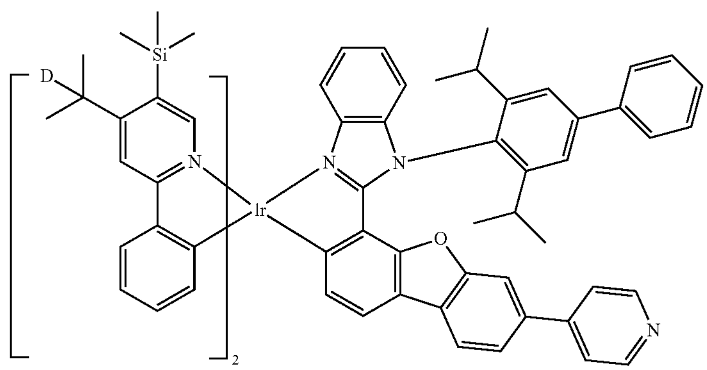
1390
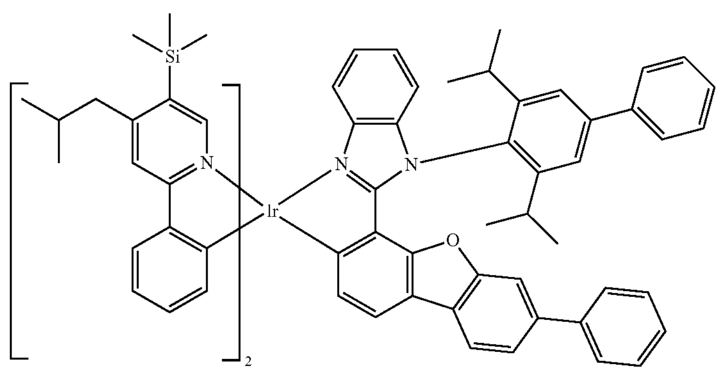
1391
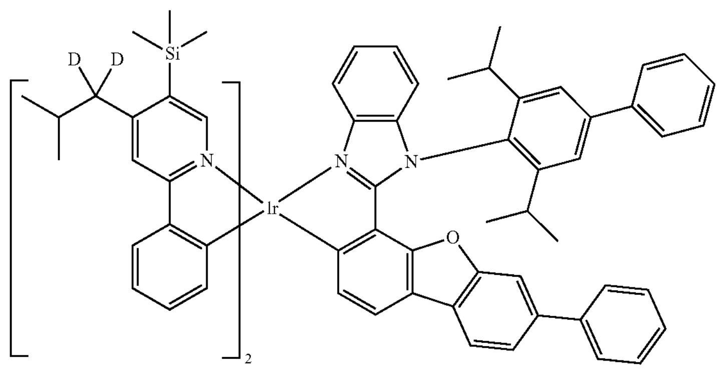
1392
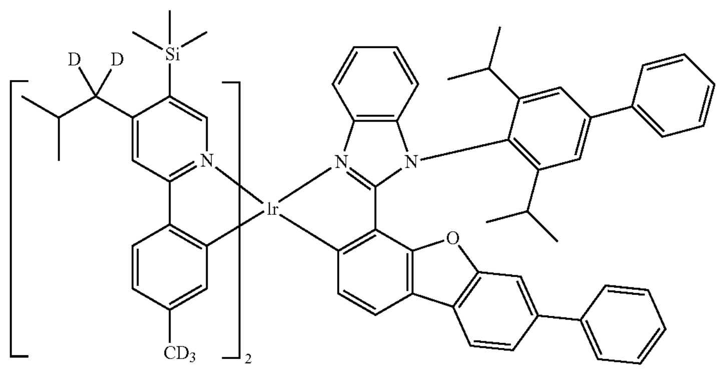

-continued
1393
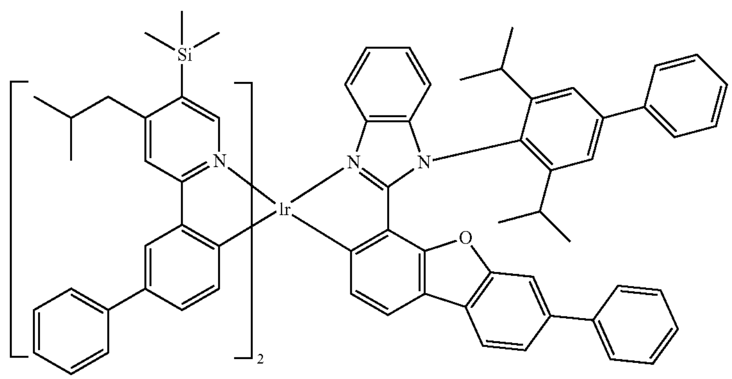
1394
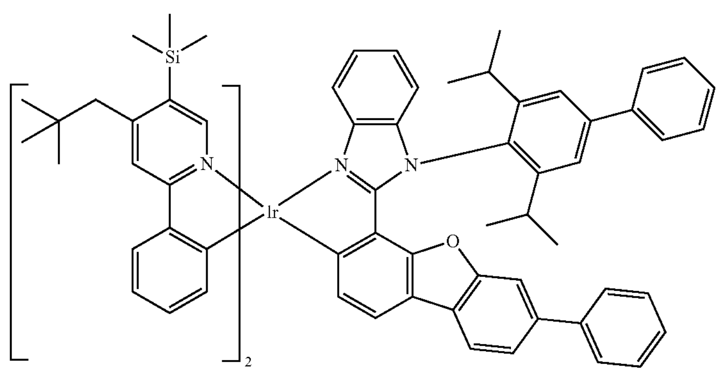
1395
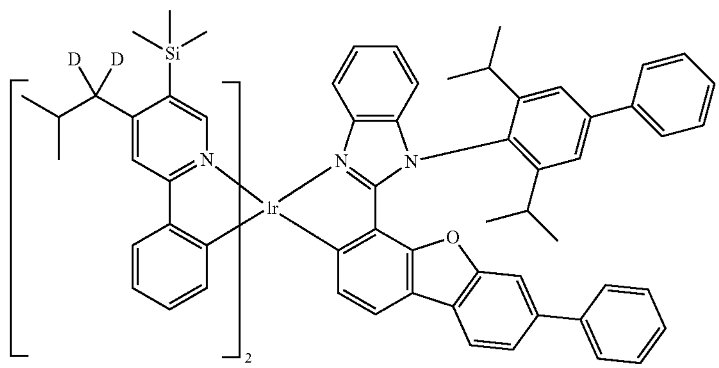
1396
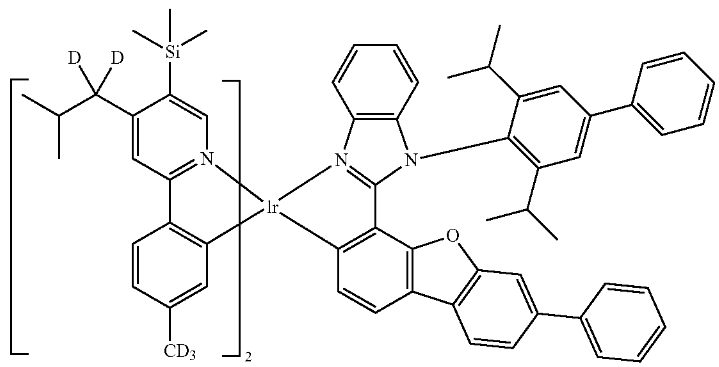

-continued
1397
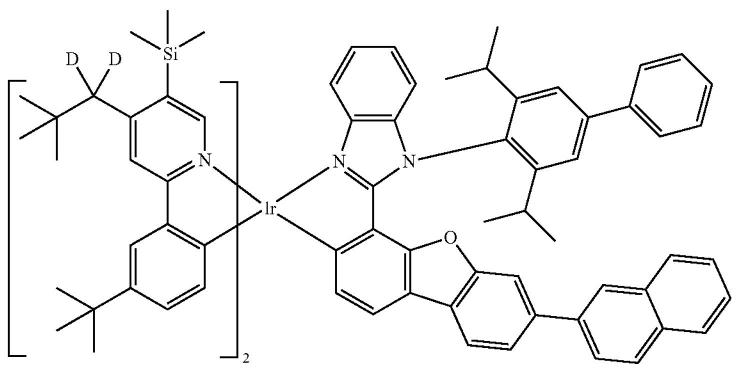
1398
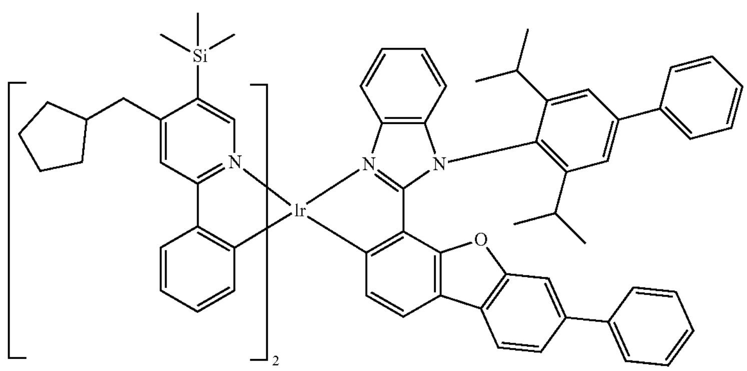
1399
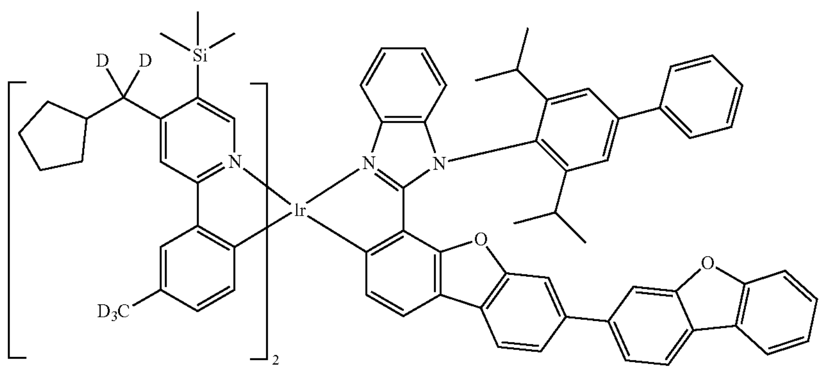
1400
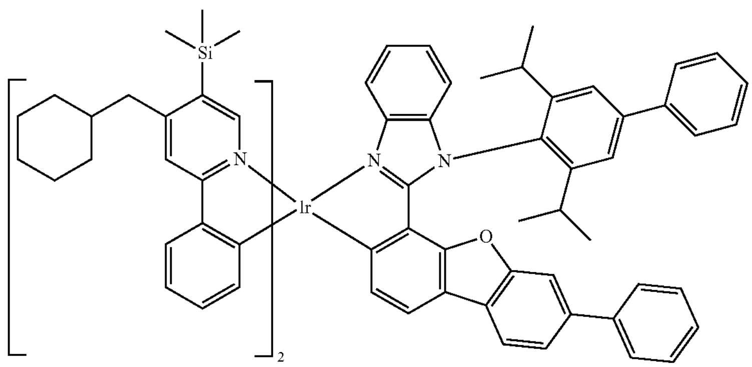

-continued
1401
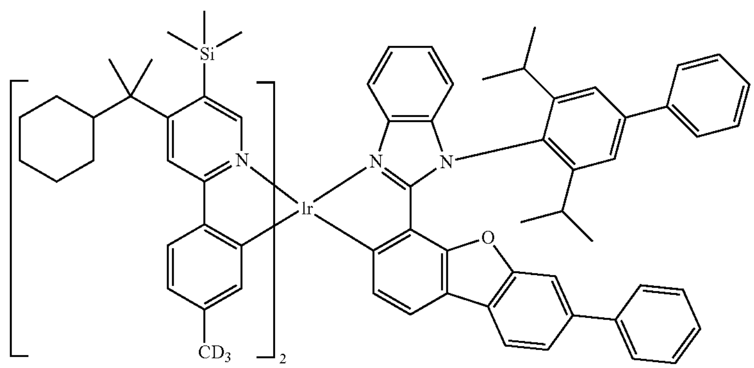
1402
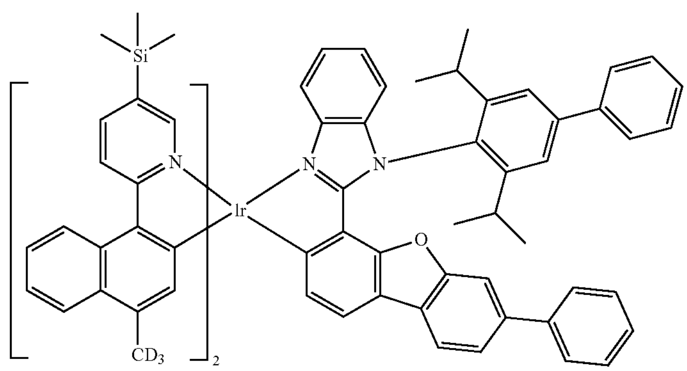
1403
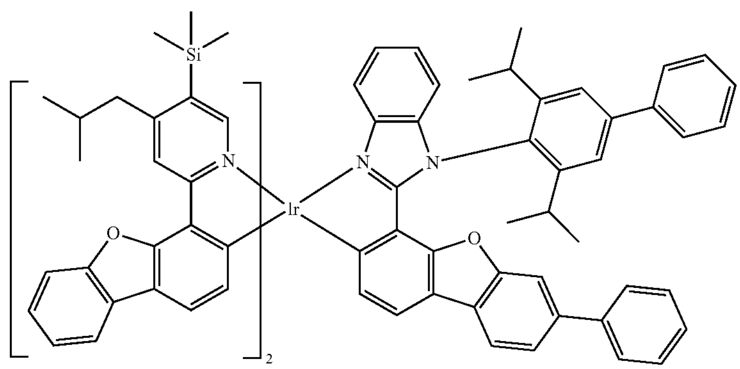
1404
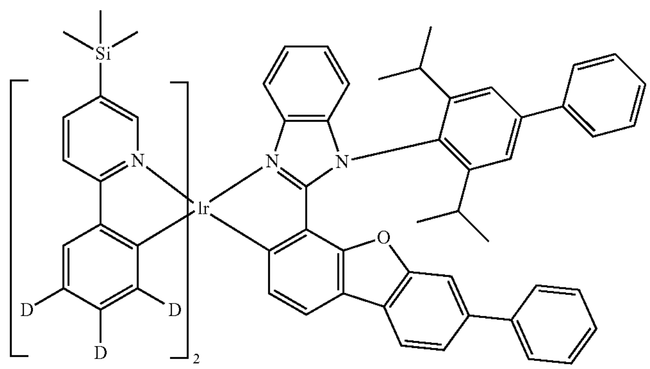

-continued
1405
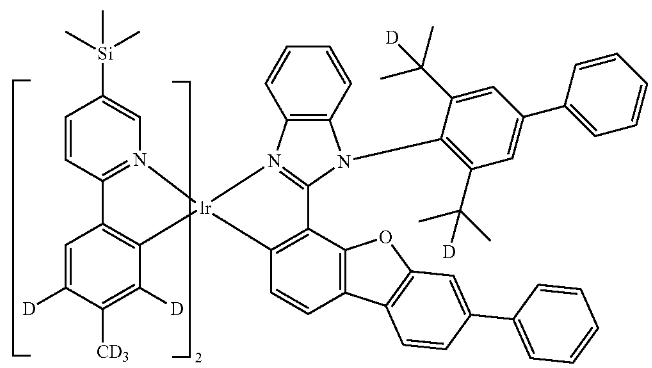
1406
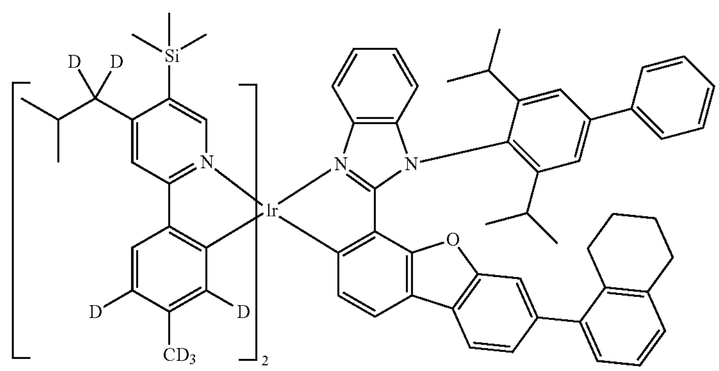
1407
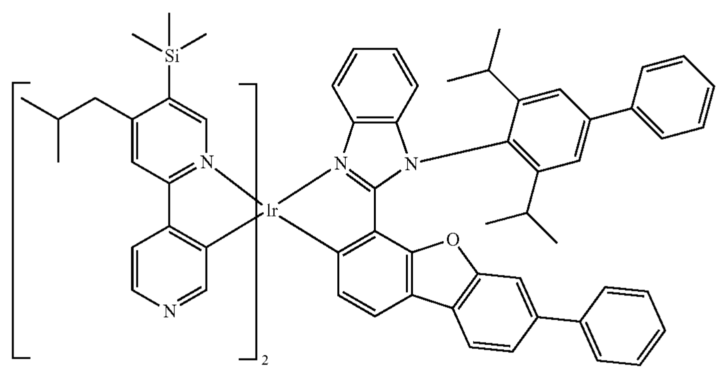
1408
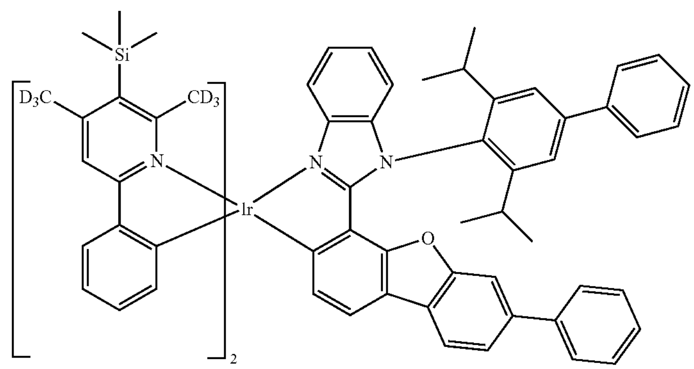

-continued
1409
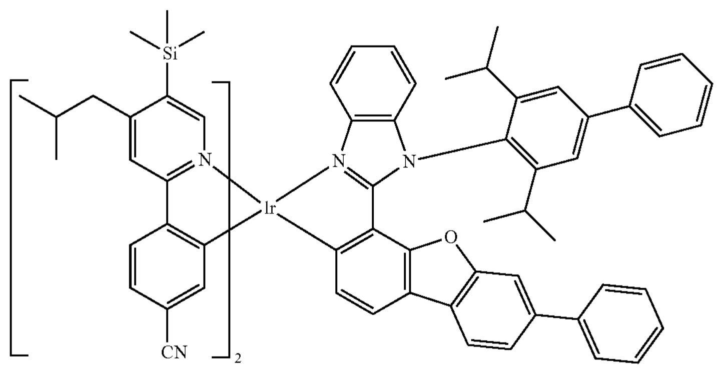
1410
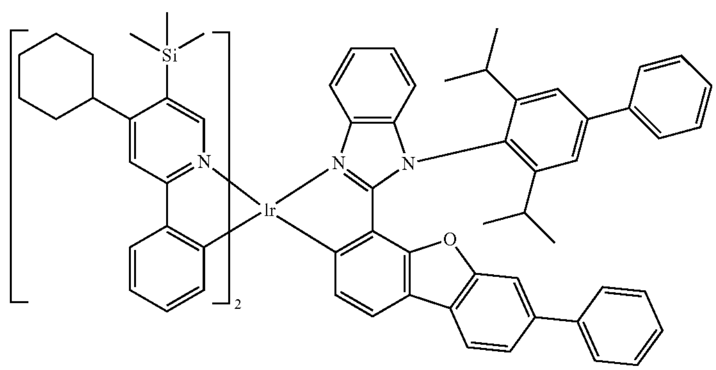
1411
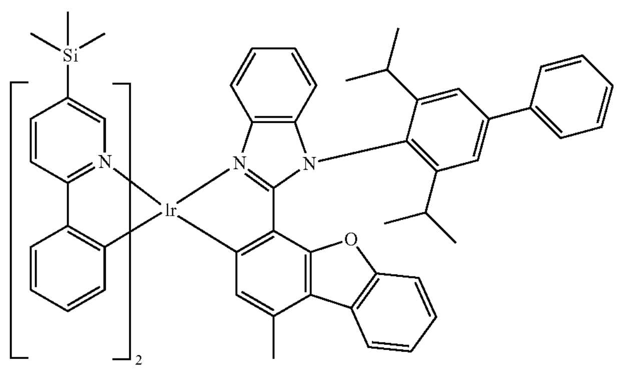
1412
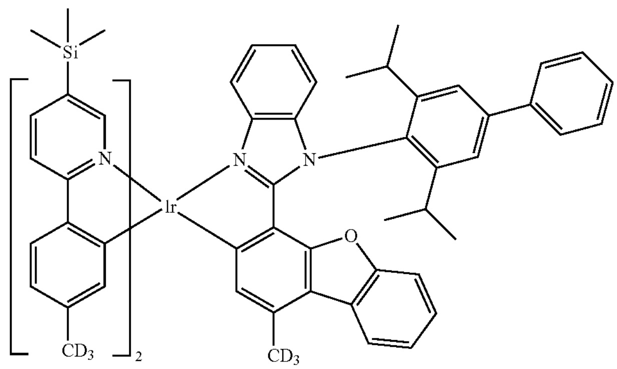

-continued
1413
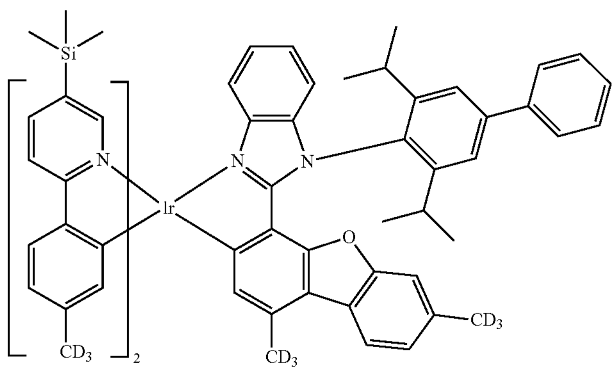
1414
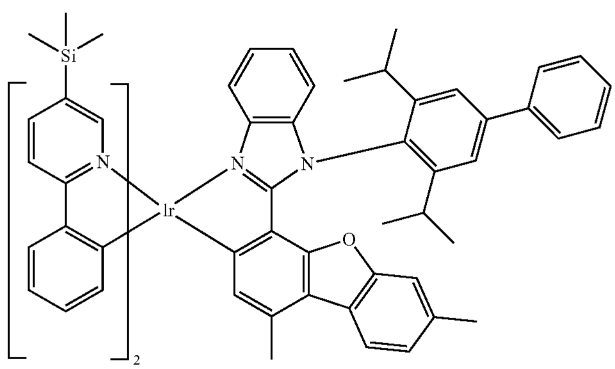
1415
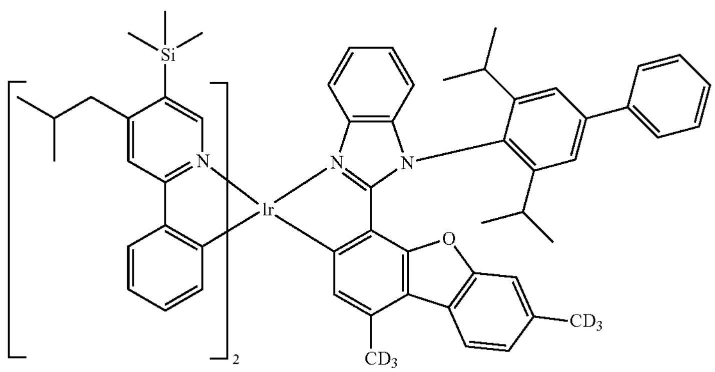
1416
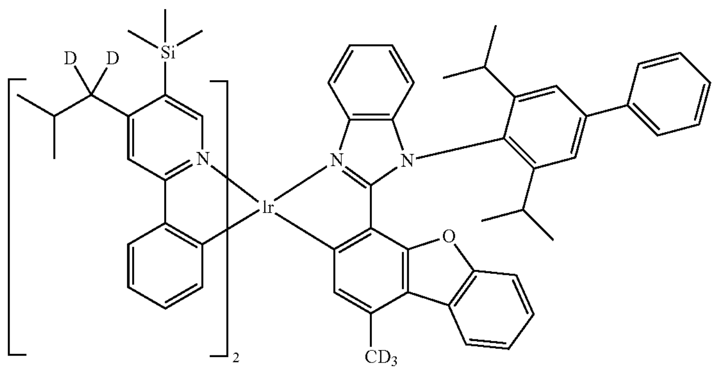

-continued
1417
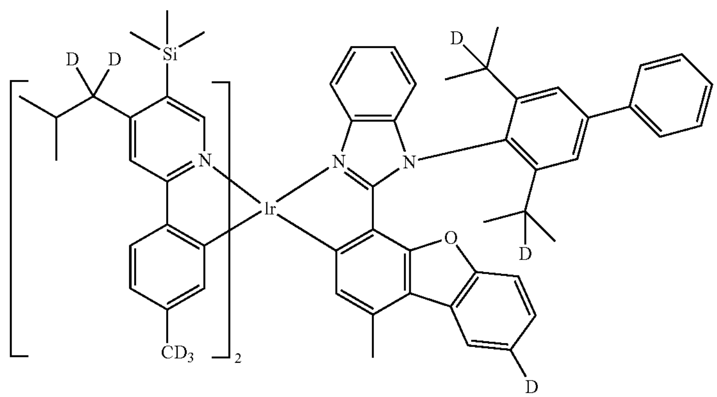
1418
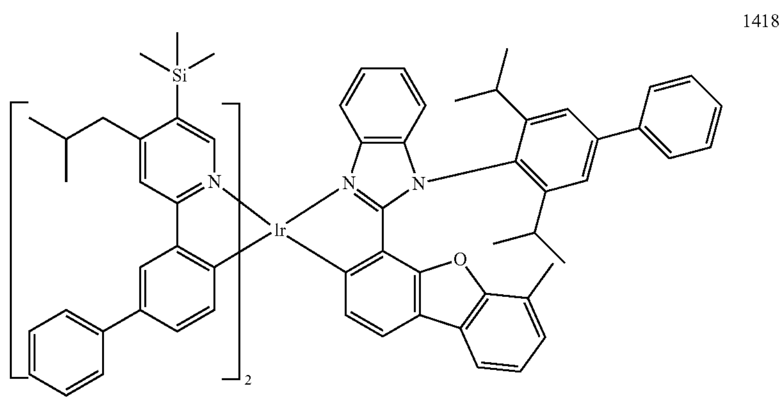
1419
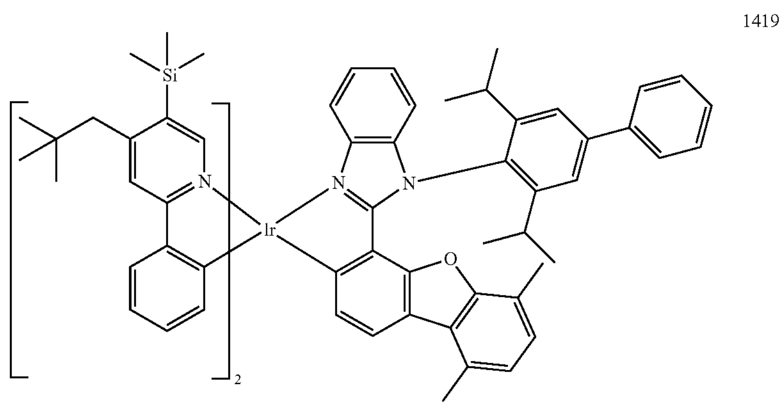
1420
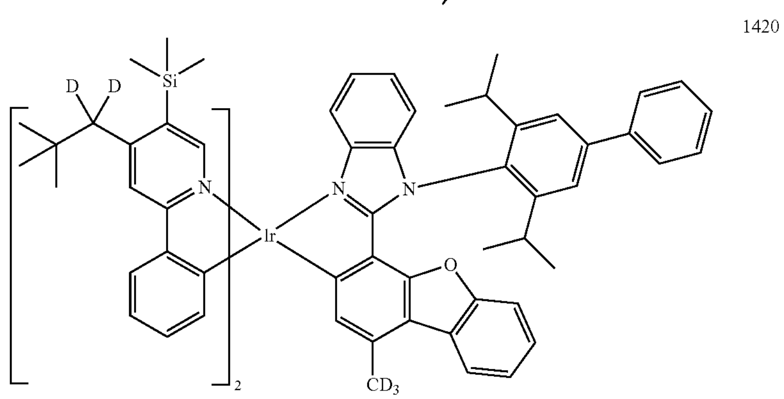

-continued
1421
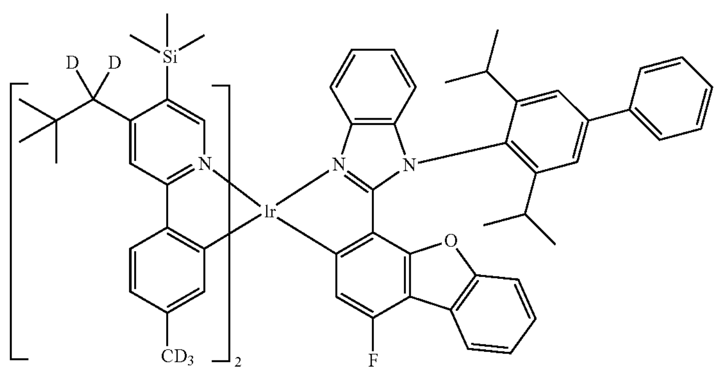
1422
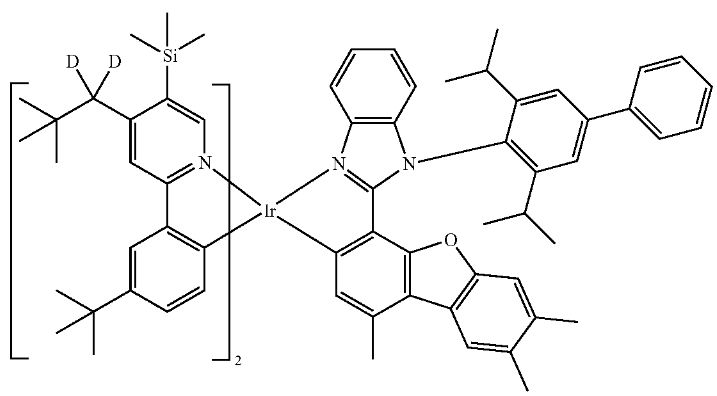
1423
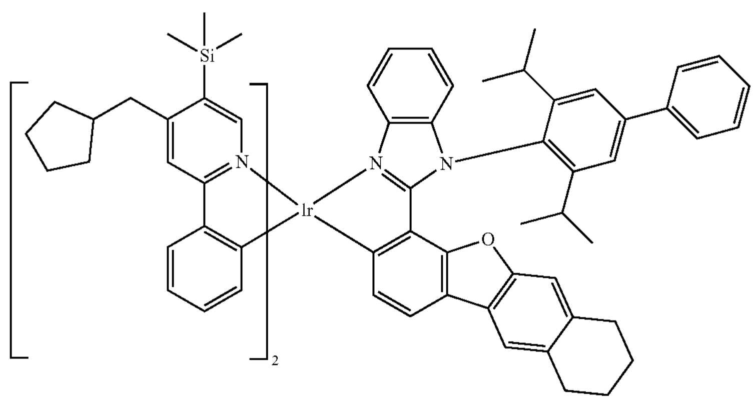
1424
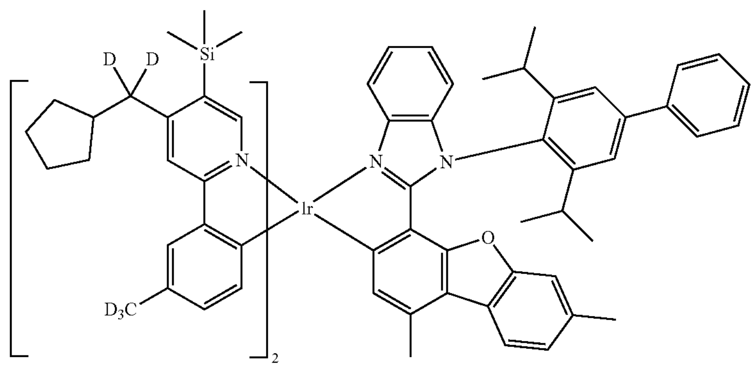

-continued
1425
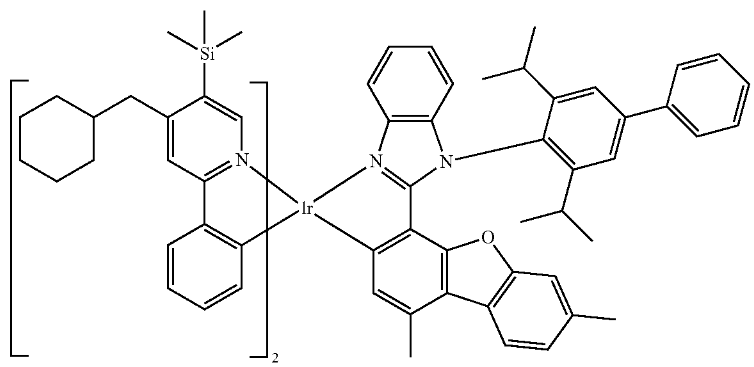
1426
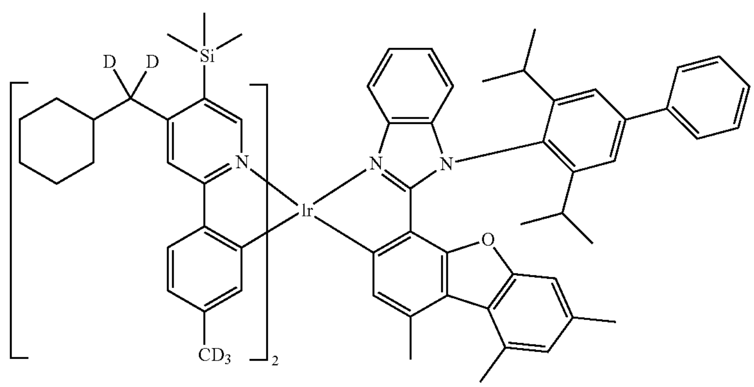
1427
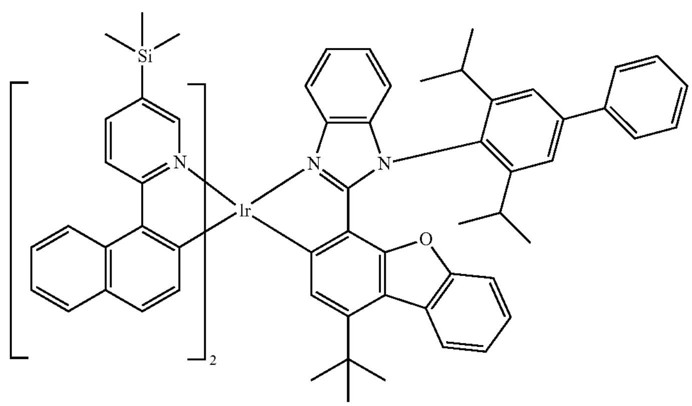
1428
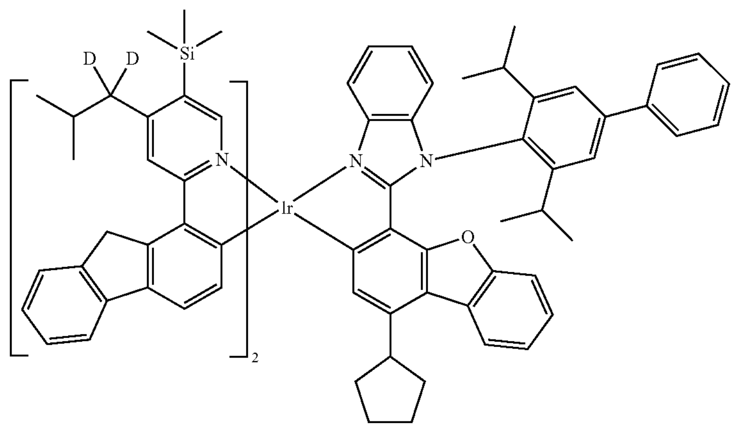

-continued
1429
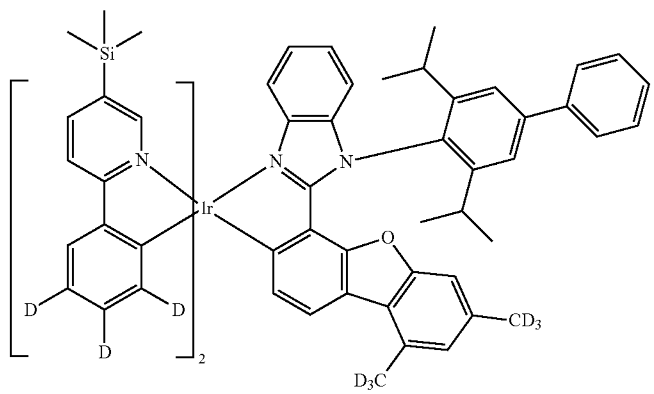
1430
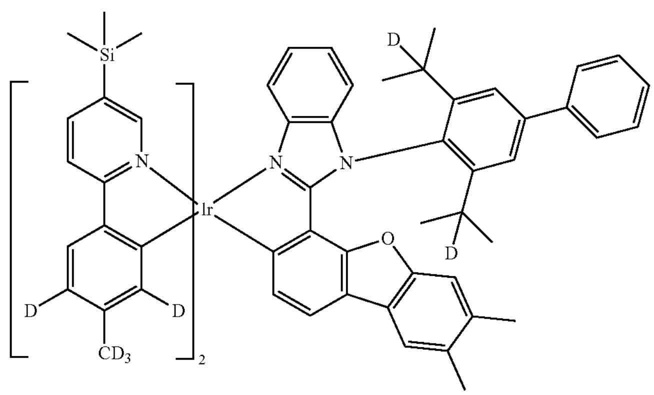
1431
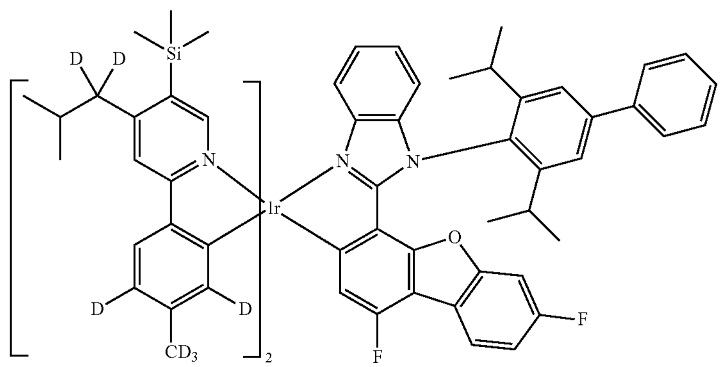
1432
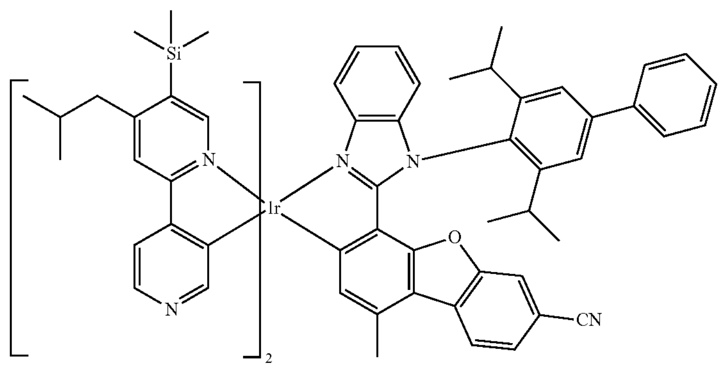

-continued
1433
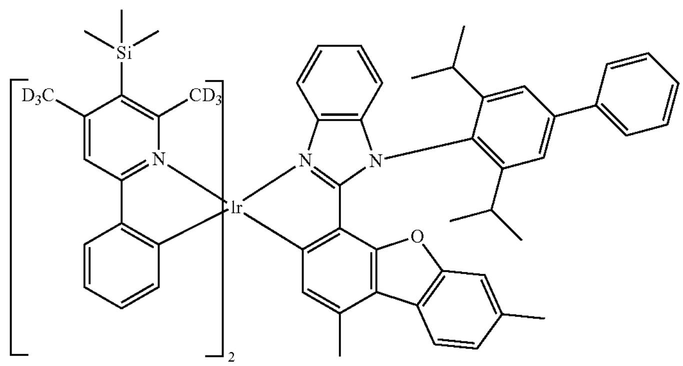
1434
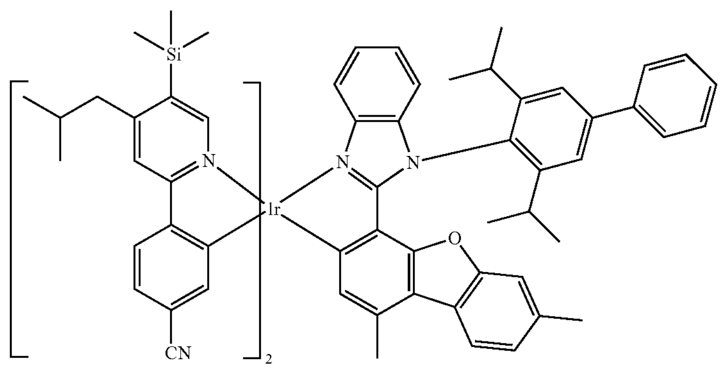
1435
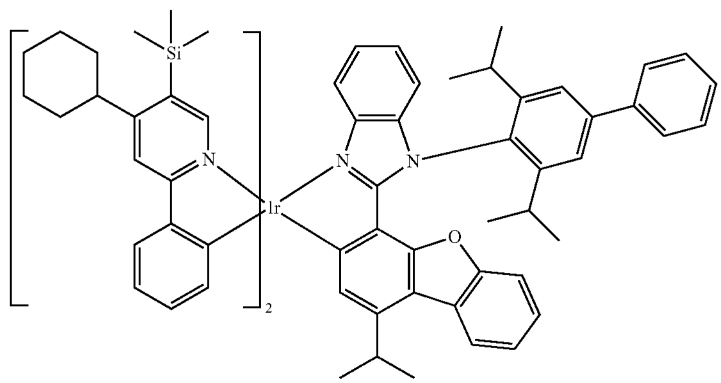
1436
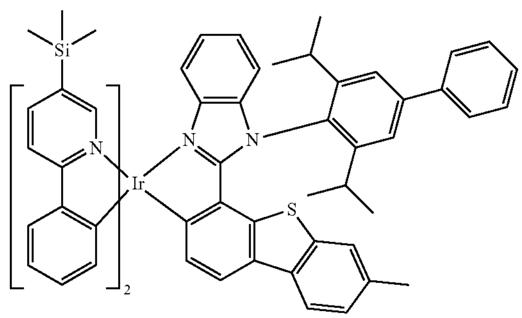
1437
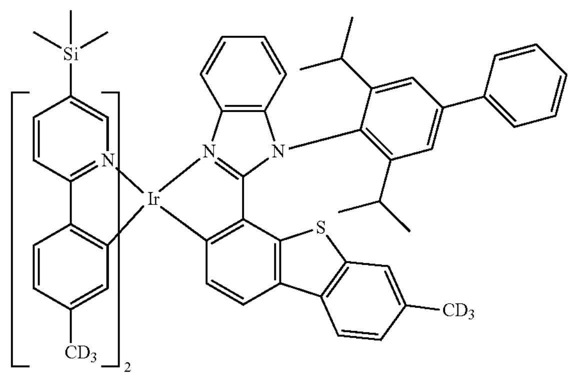

-continued
1438
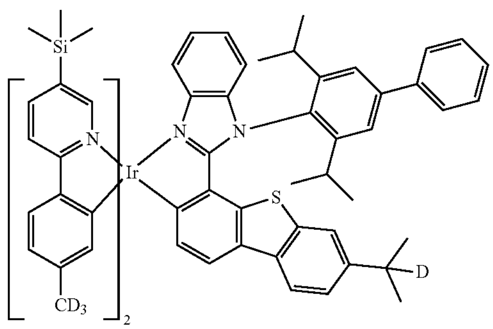
1439
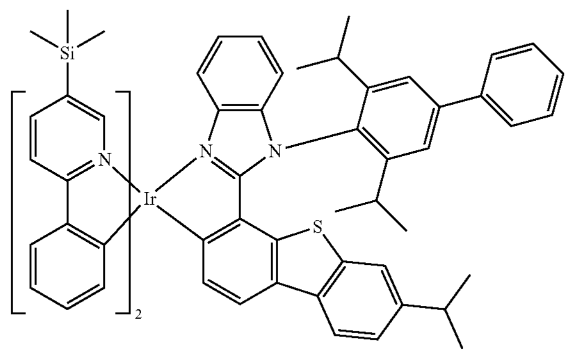
1440
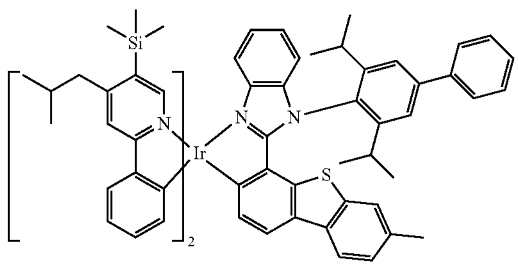
1441
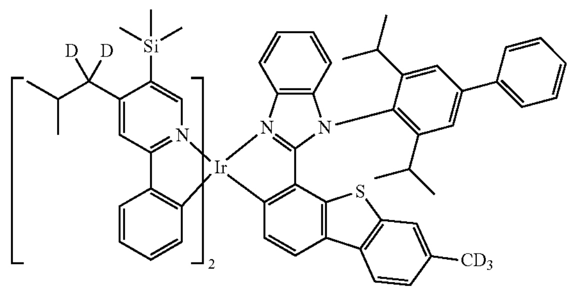
1442
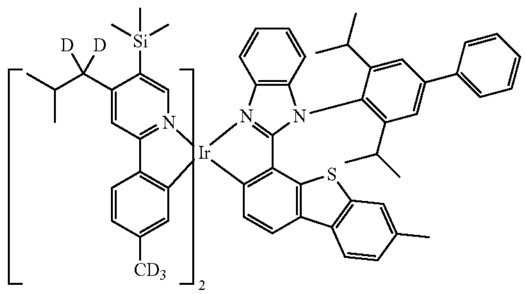
1443
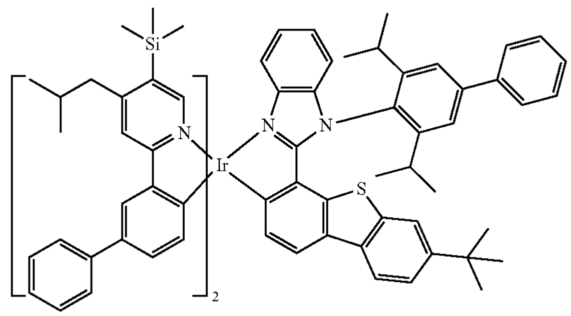
1444
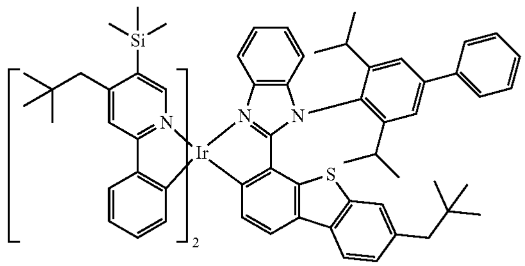
1445
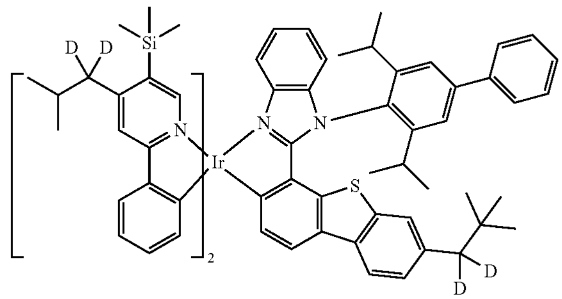

-continued
1446
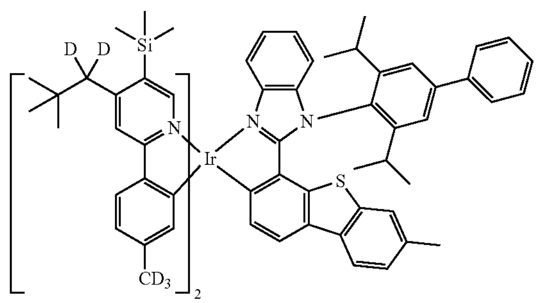
1447
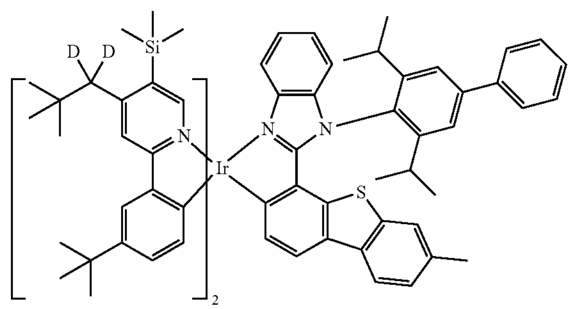
1448
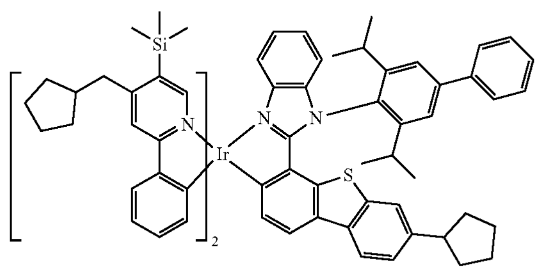
1449
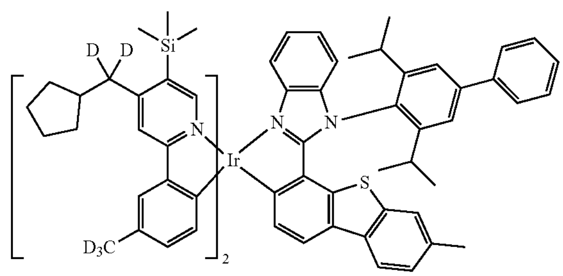
1450
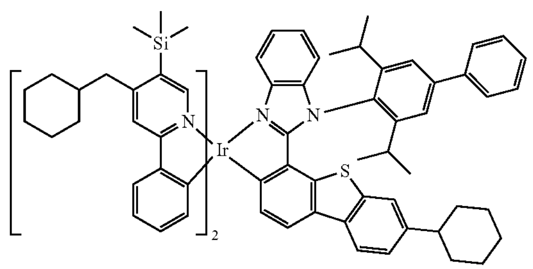
1451
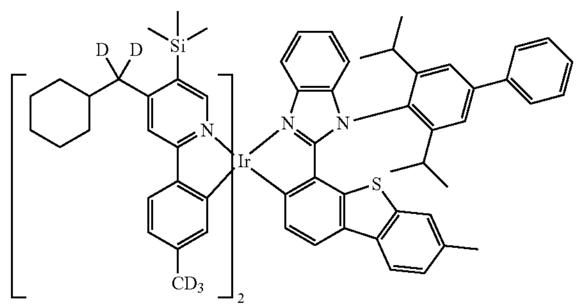
1452
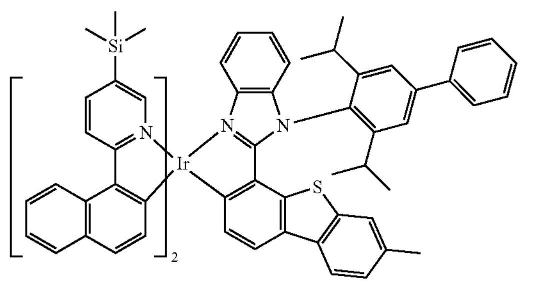
1453
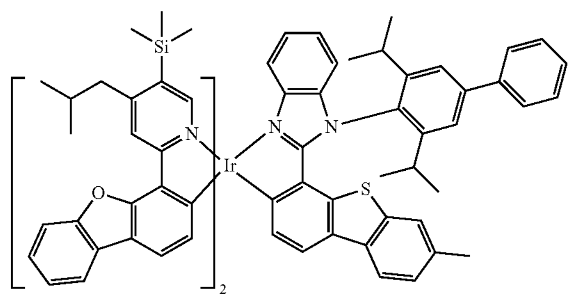
1454
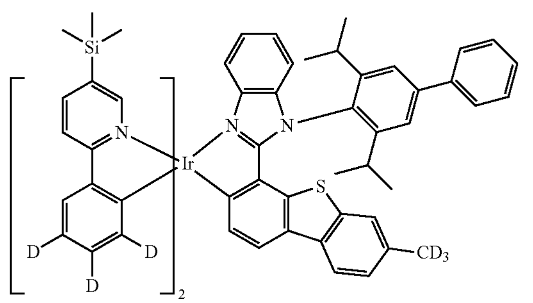
1455
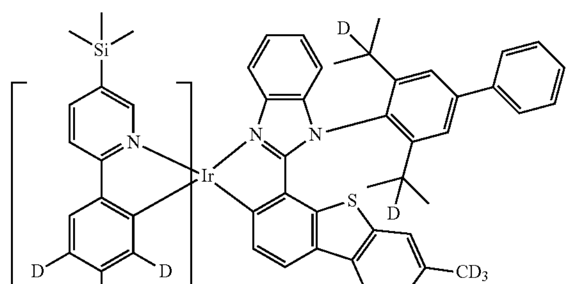

-continued
1456
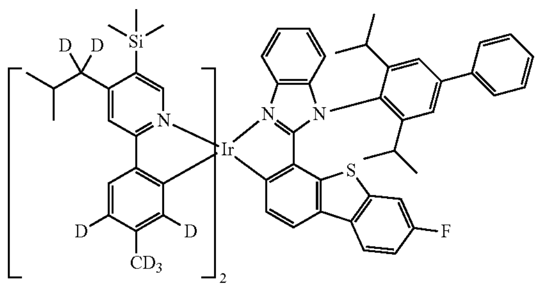
1457
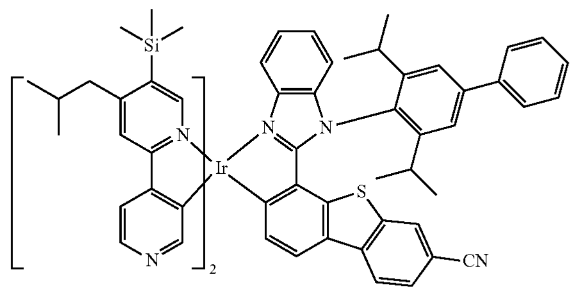
1458
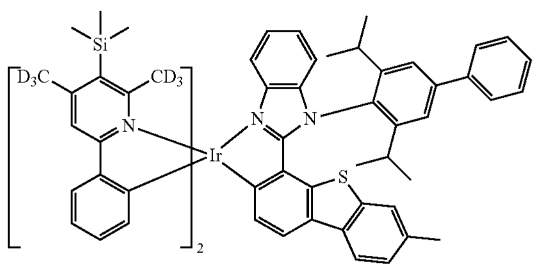
1459
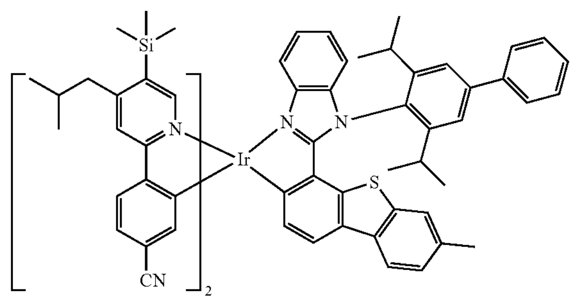
1460
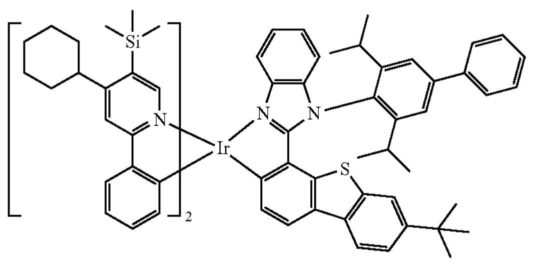
1461
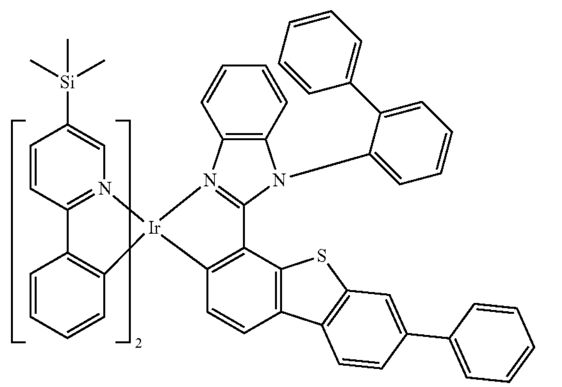
1462
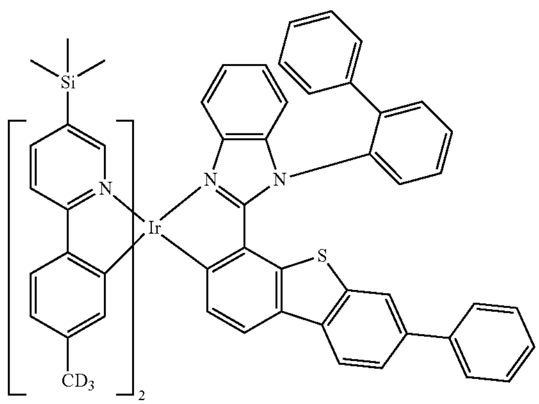
1463
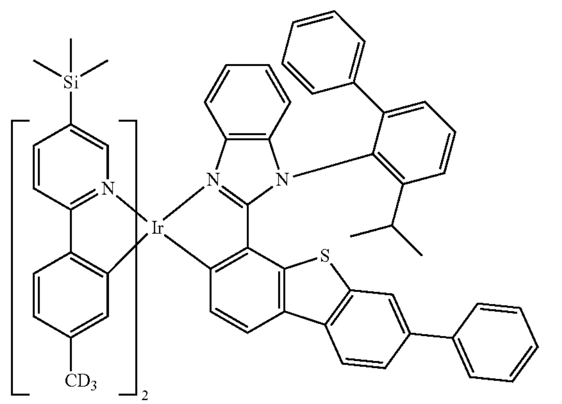

-continued
1464
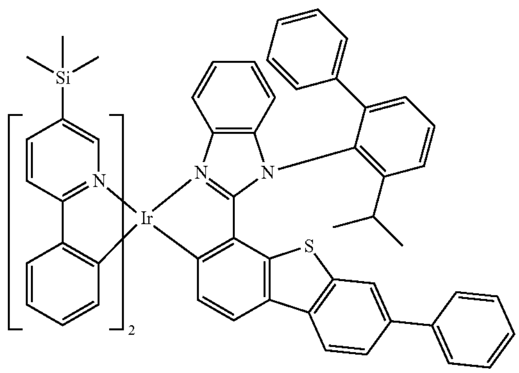
1465
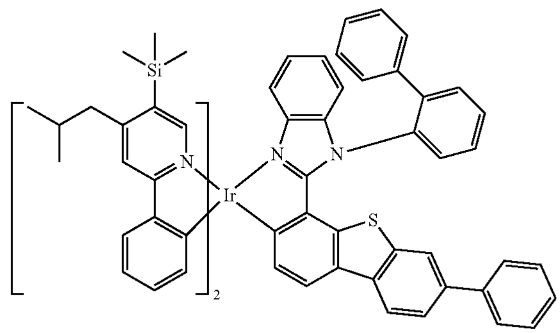
1466
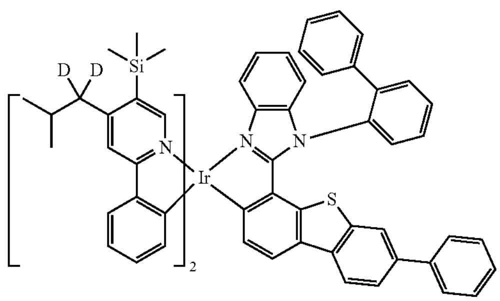
1467
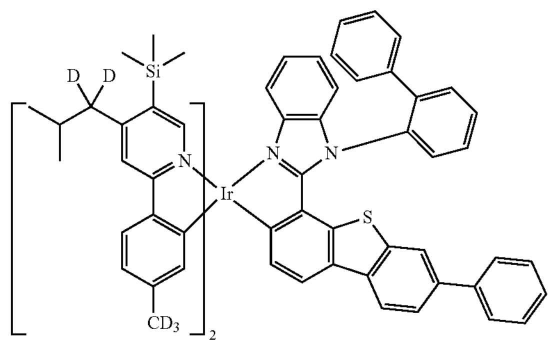
1468
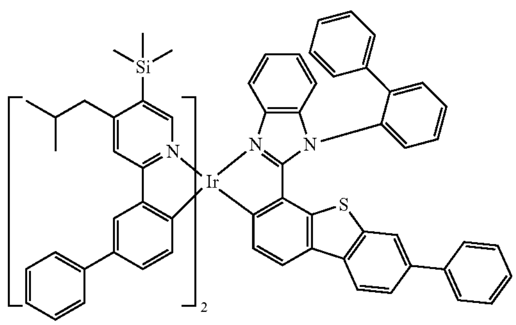
1469
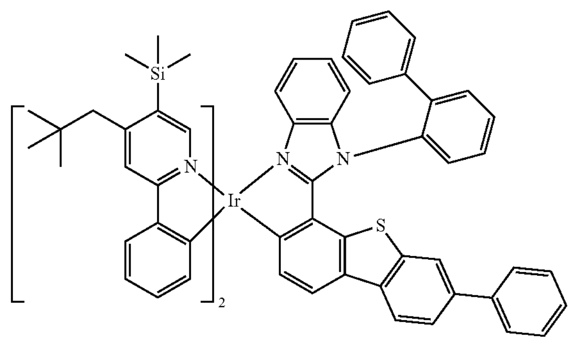
1470
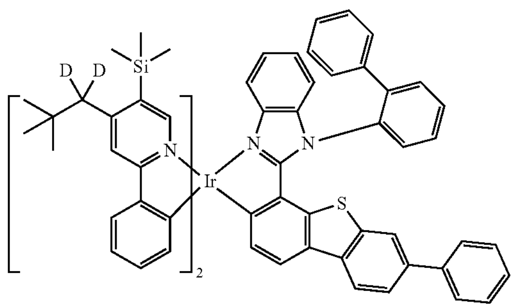
1471
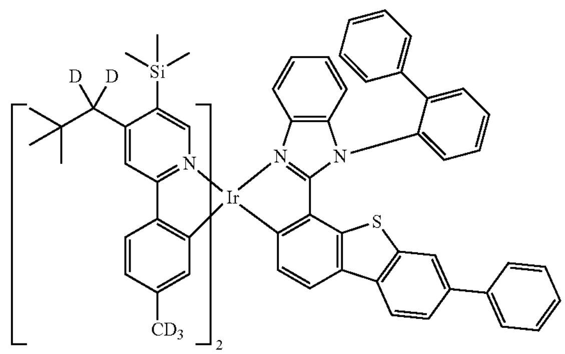

-continued
1472
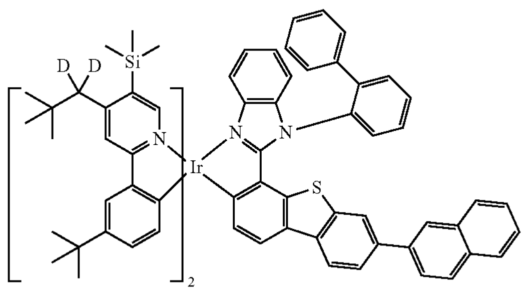
1473
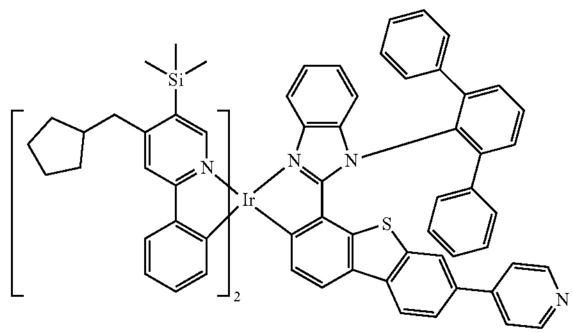
1474
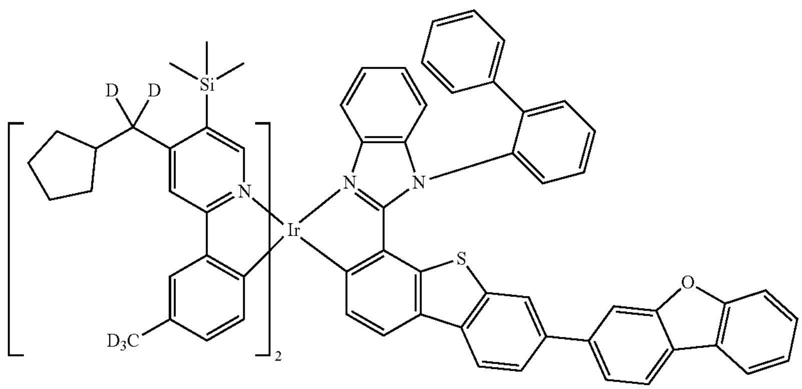
1475
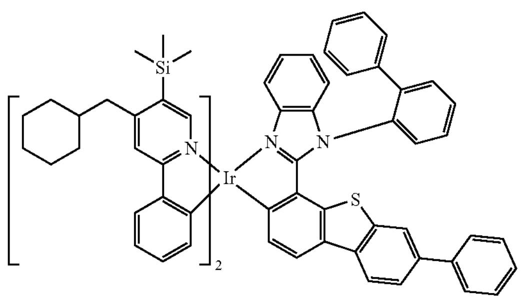
1476
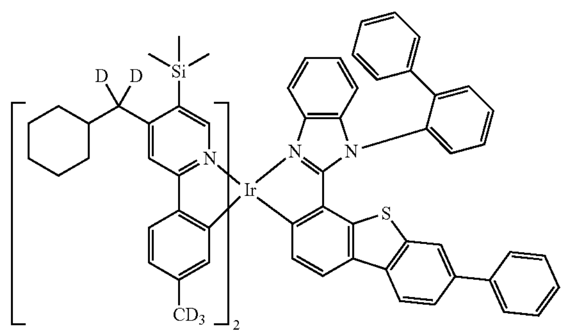
1477
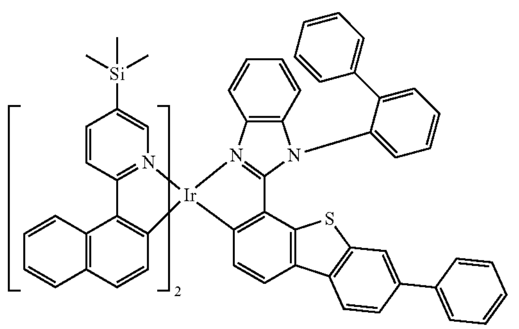
1478
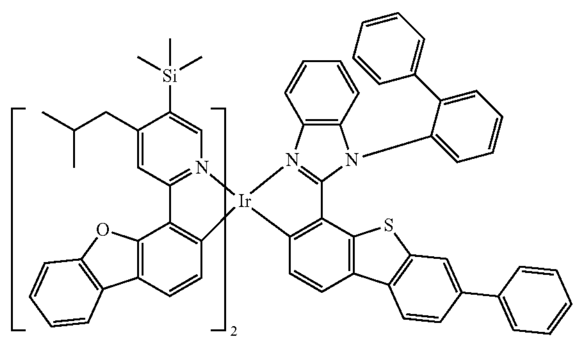

-continued
1479
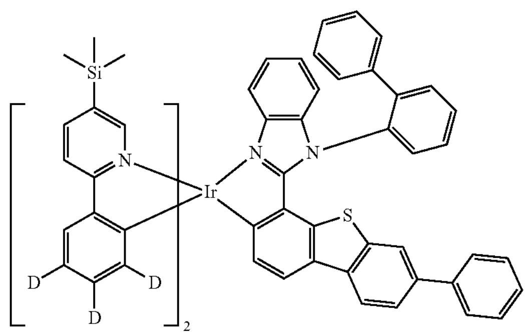
1480
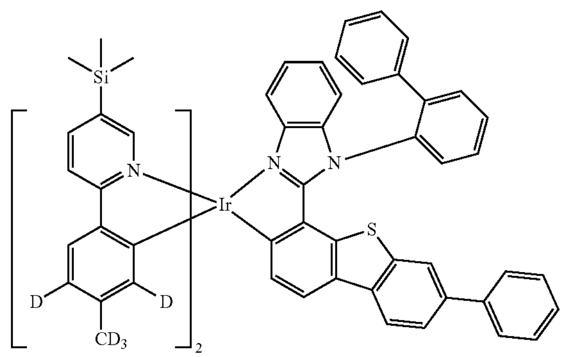
1481
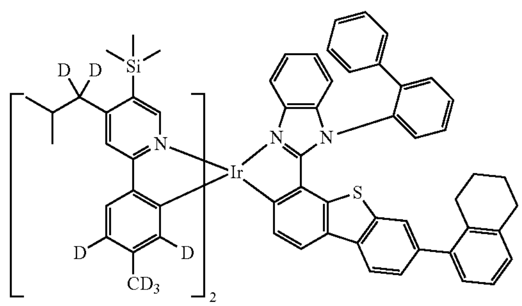
1482
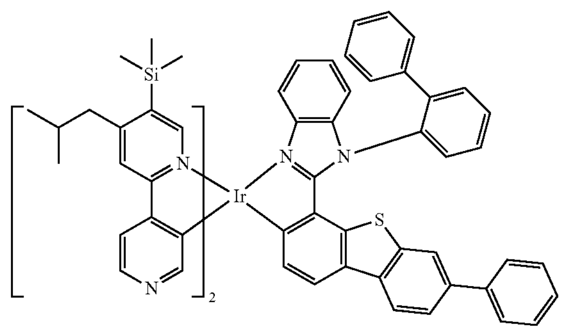
1483
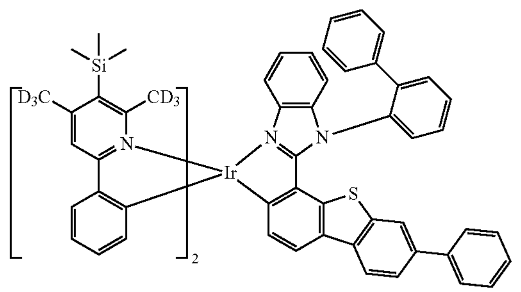
1484
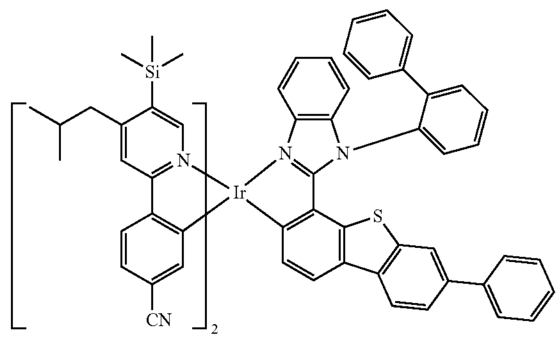
1485
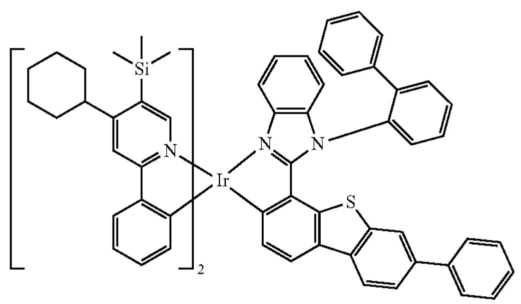
1486
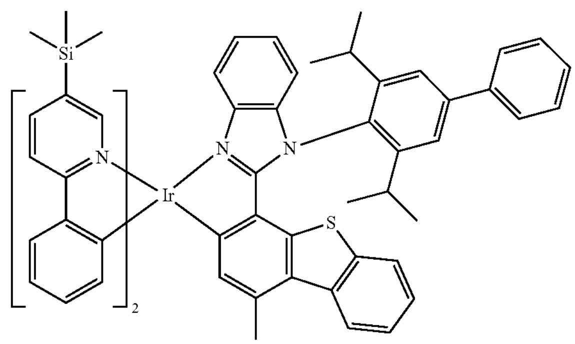

-continued
1487
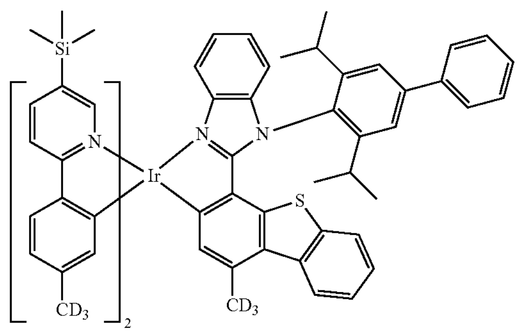
1488
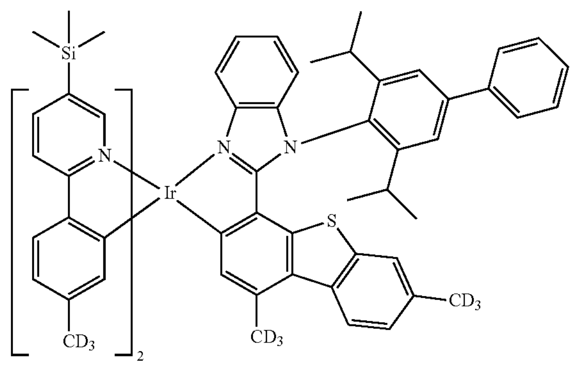
1489
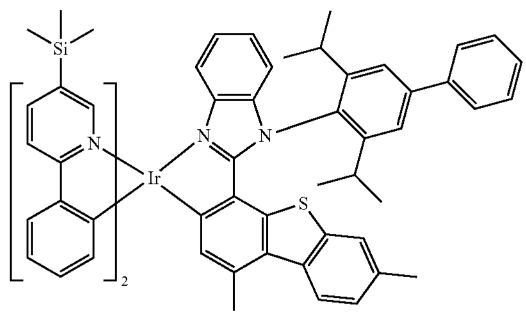
1490
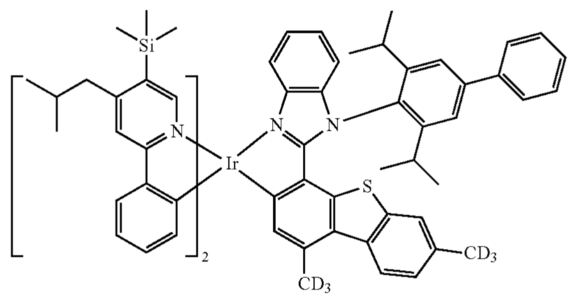
1491
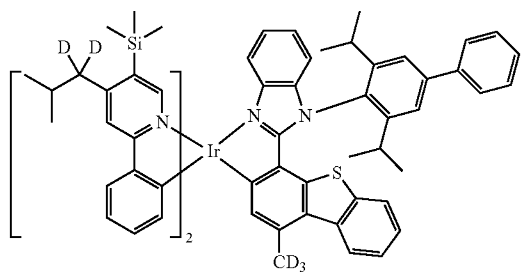
1492
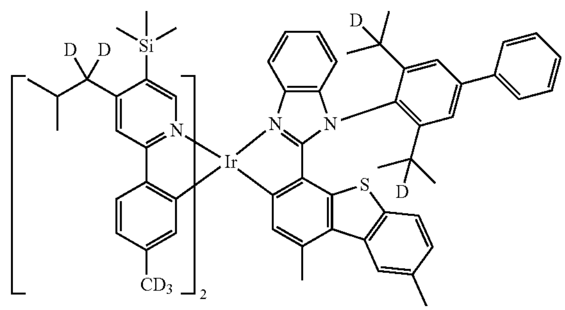
1493
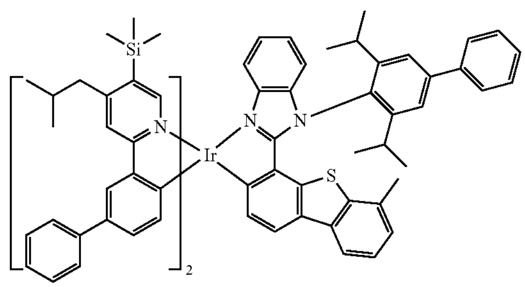
1494
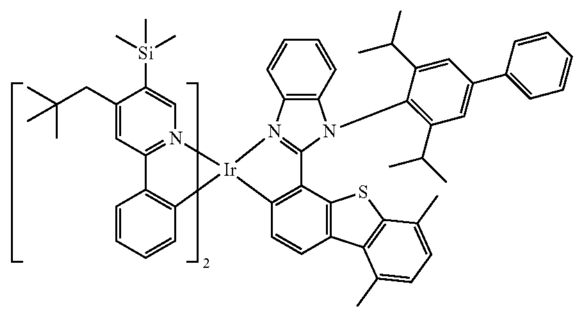

-continued
1495
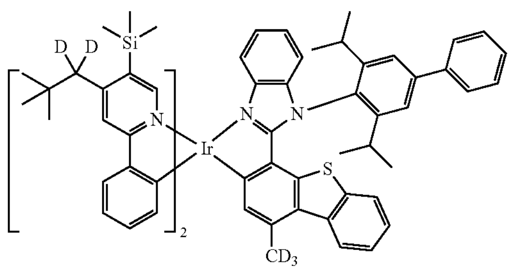
1496
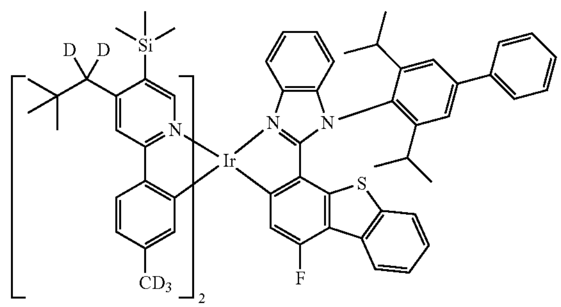
1497
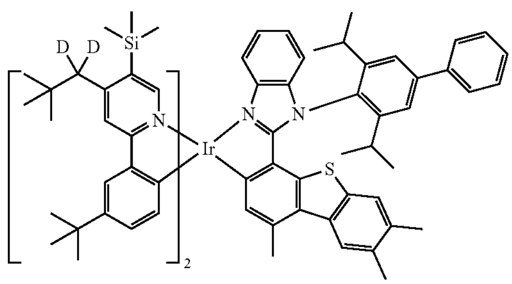
1498
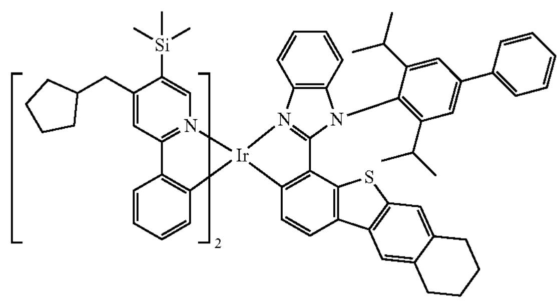
1499
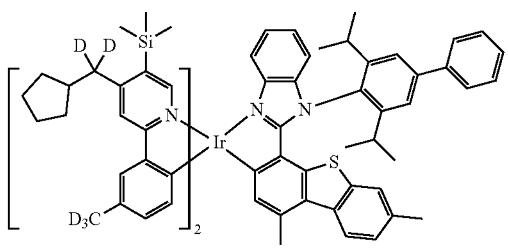
1500
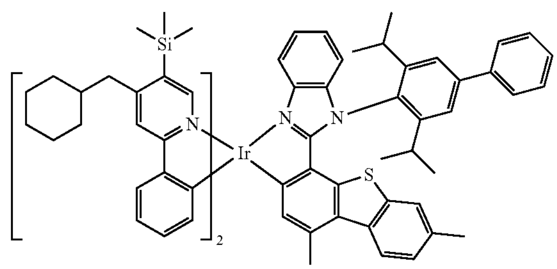
1501
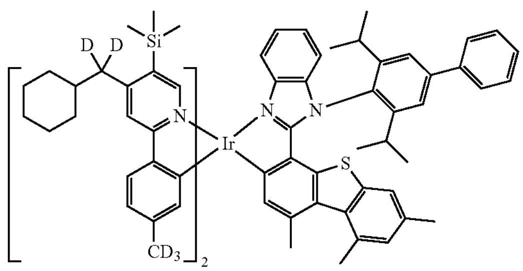
1502
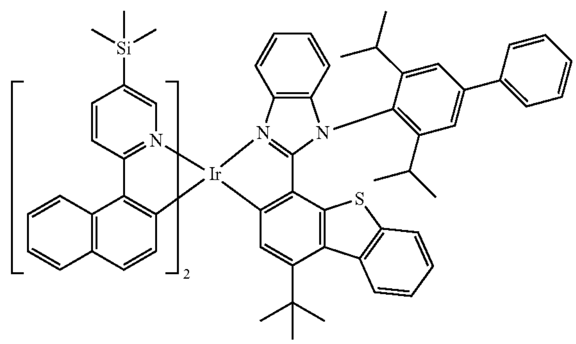
1503
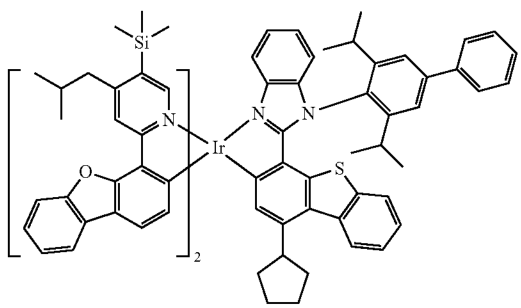
1504
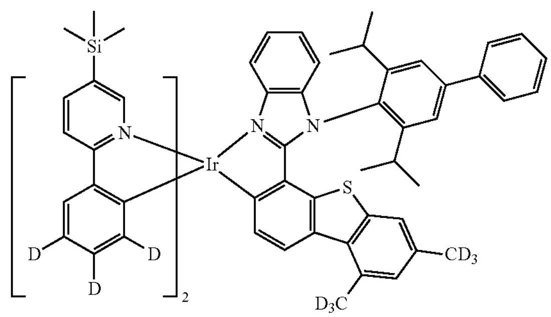

-continued
1505
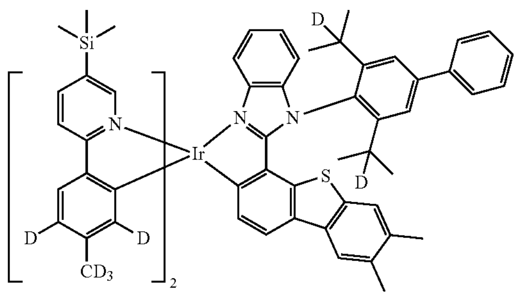
1506
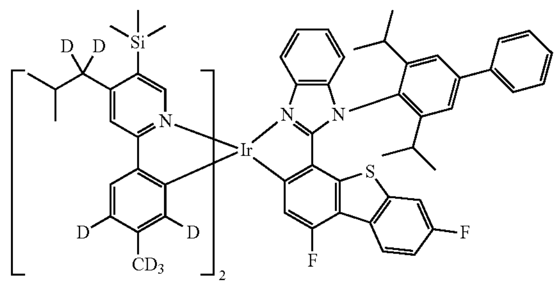
1507
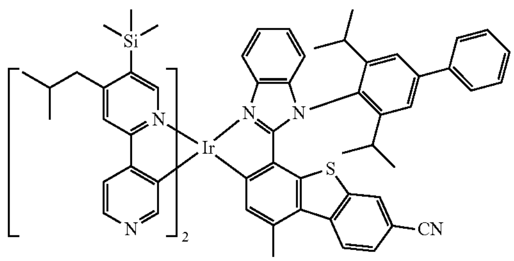
1508
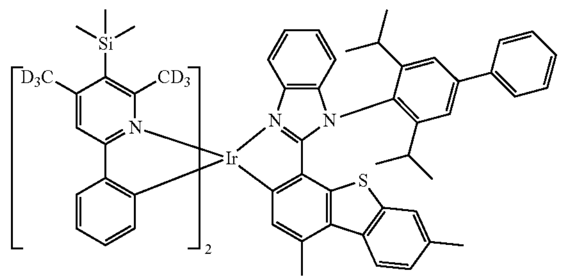
1509
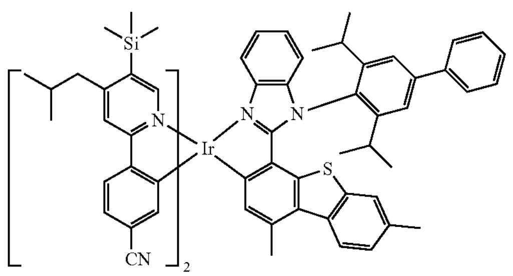
1510
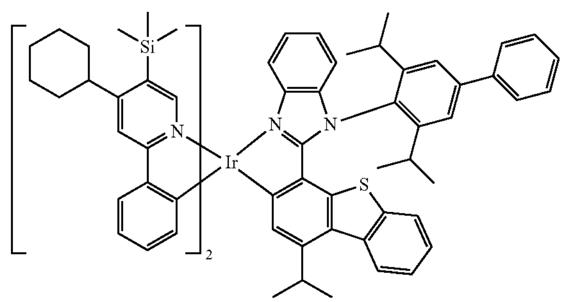
1511
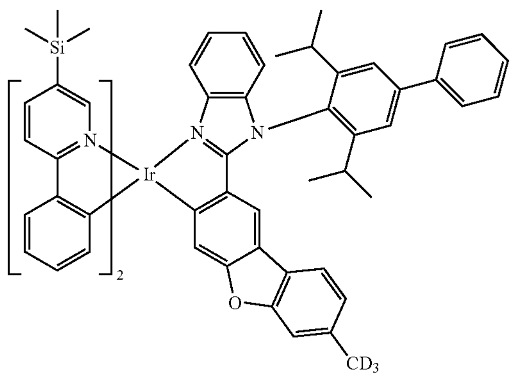
1512
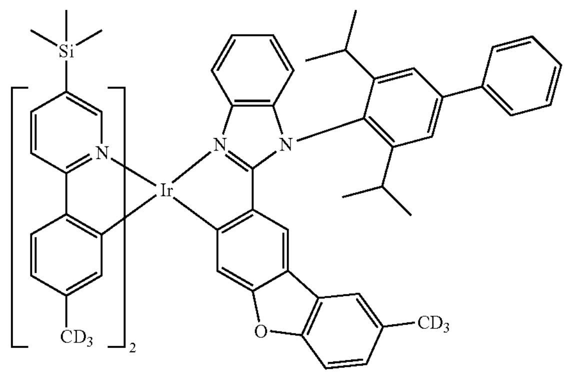

-continued
1513
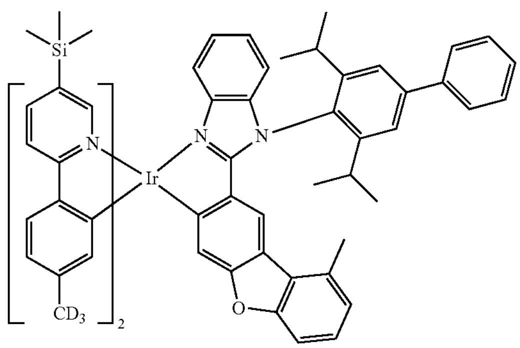
1514
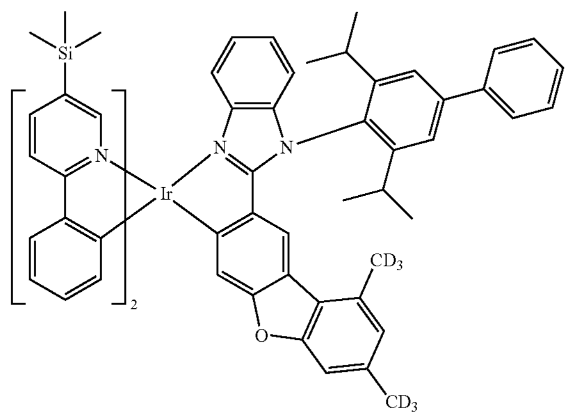
1515
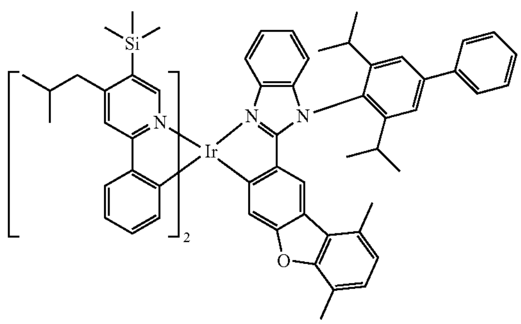
1516
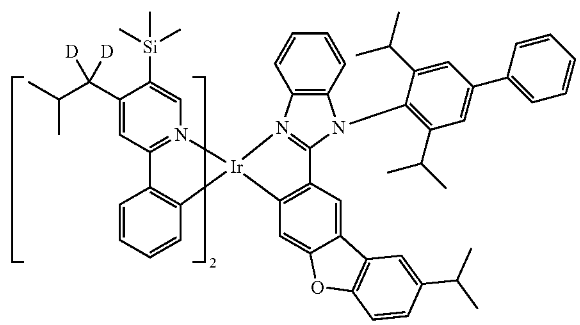
1517
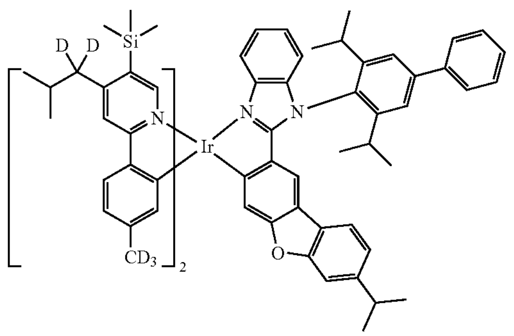
1518
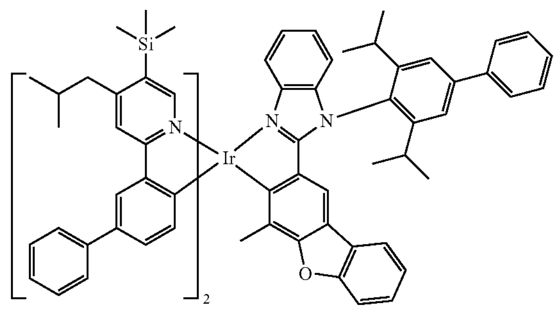
1519
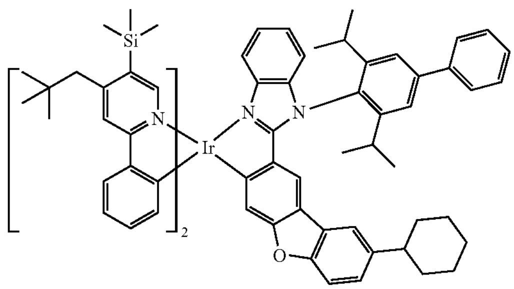
1520
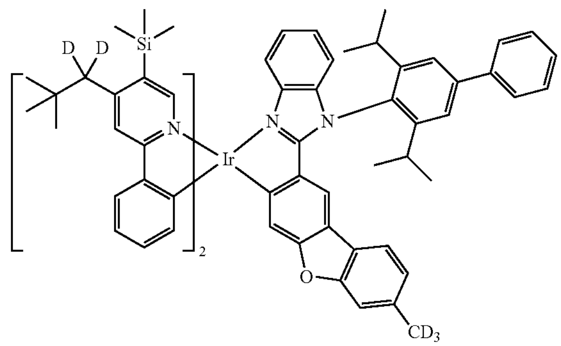

-continued
1521
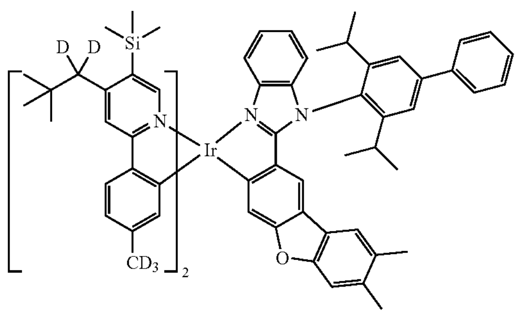
1522
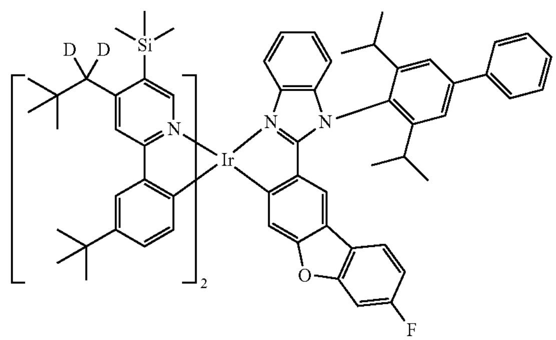
1523
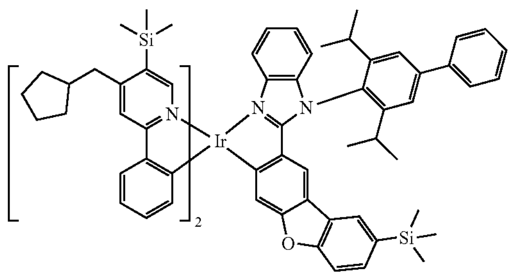
1524
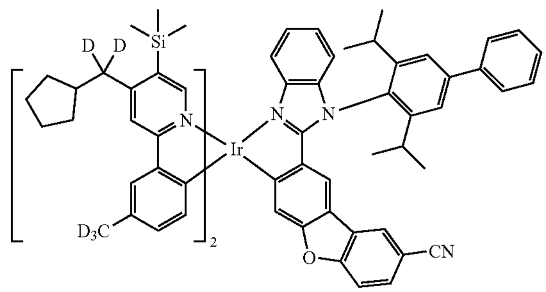
1525
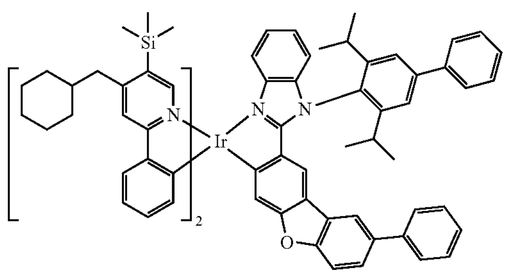
1526
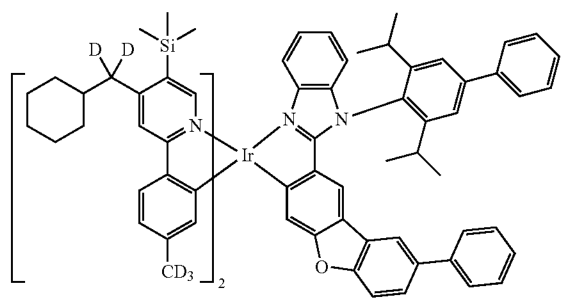
1527
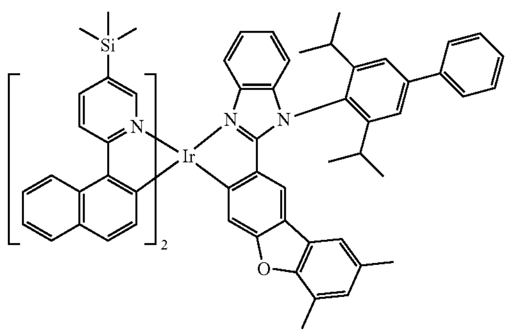
1528
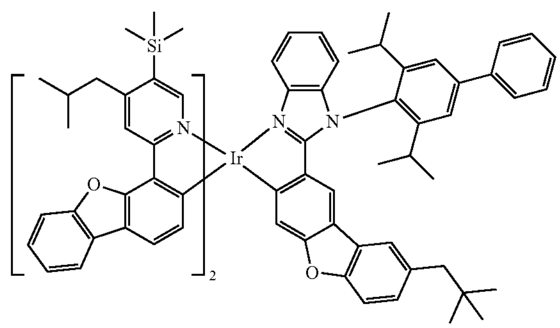

-continued
1529
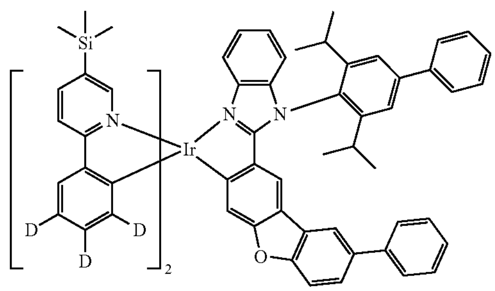
1530
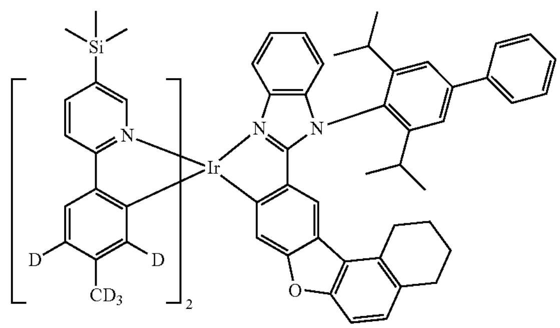
1531
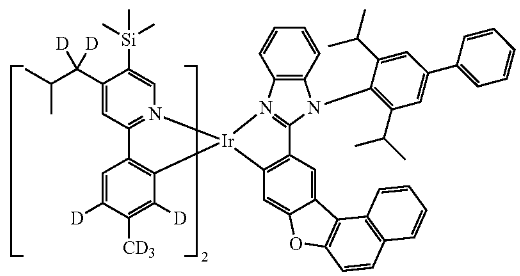
1532
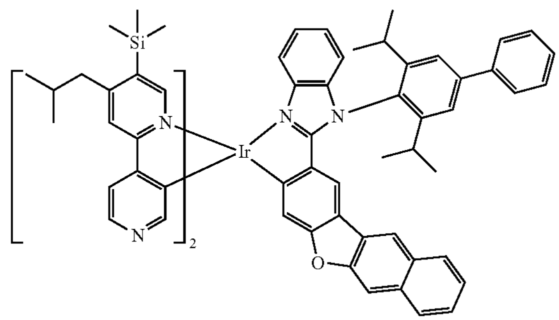
1533
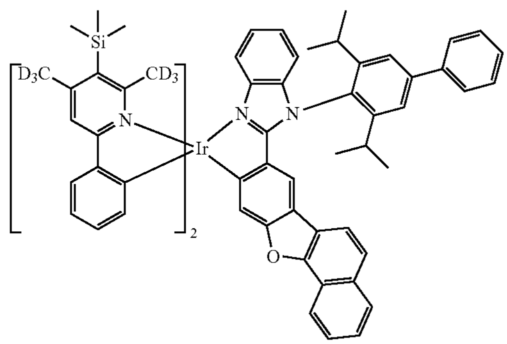
1534
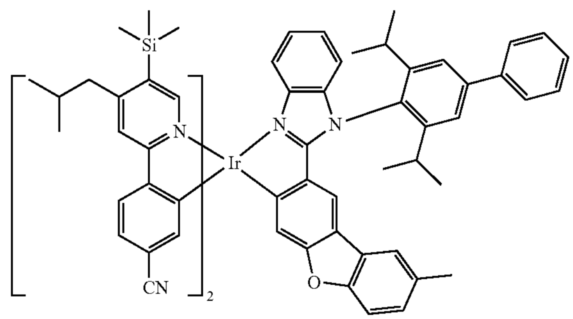
1535
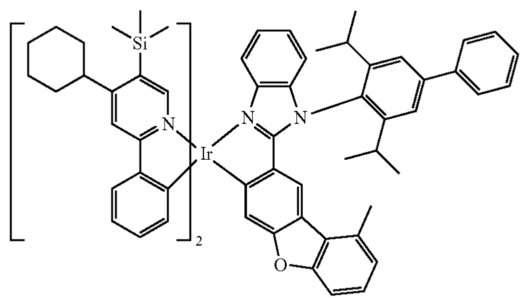
1536
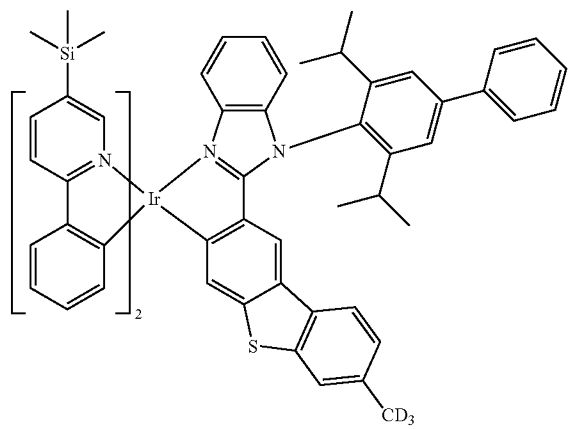

-continued
1537
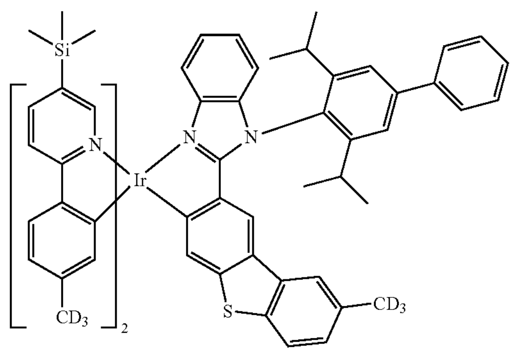
1538
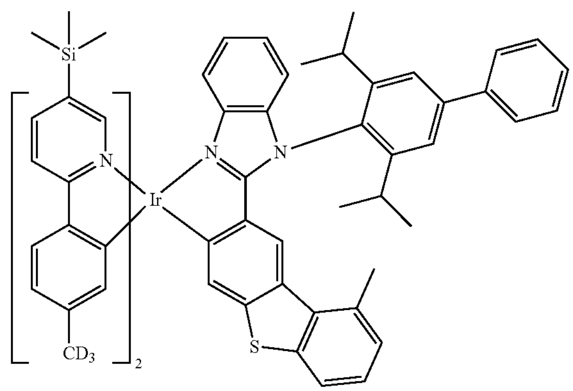
1539
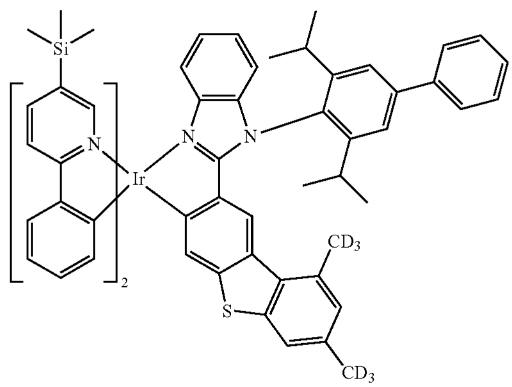
1540
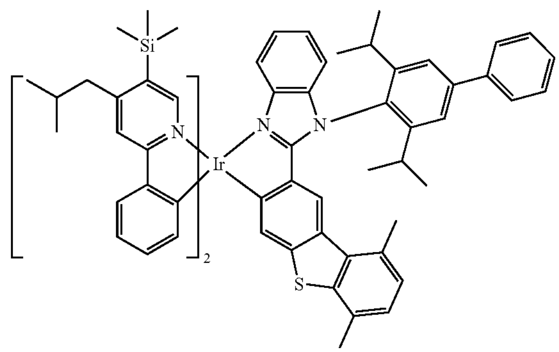
1541
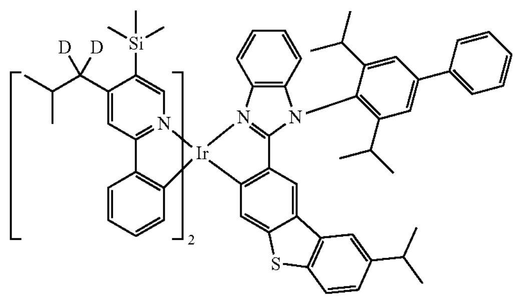
1542
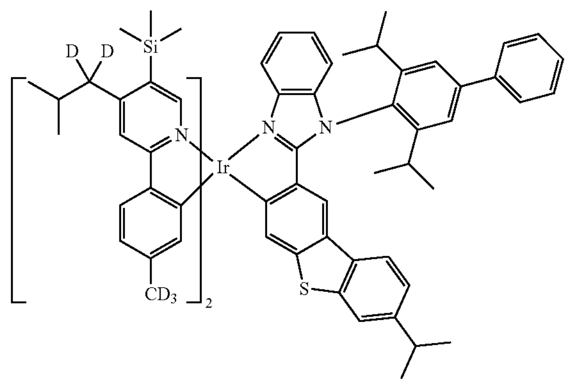
1543
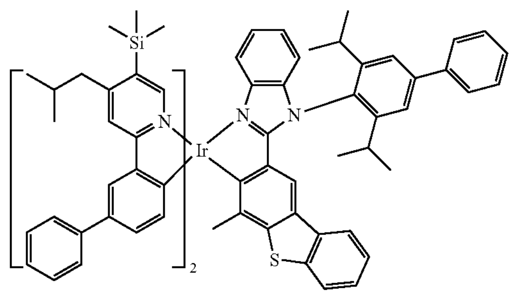
1544
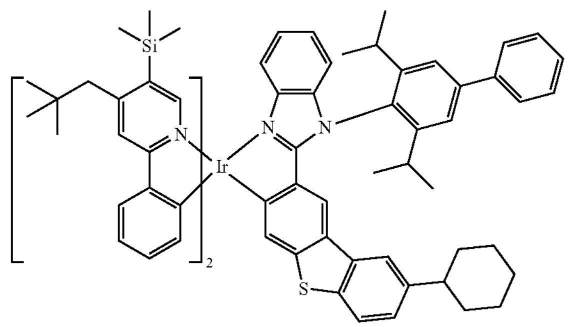

-continued
1545
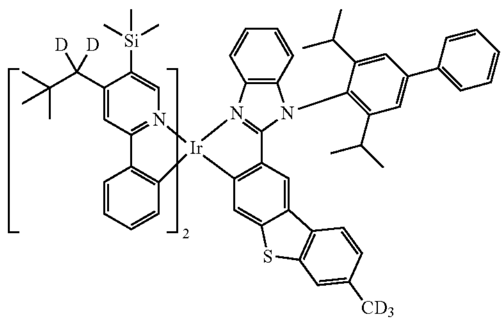
1546
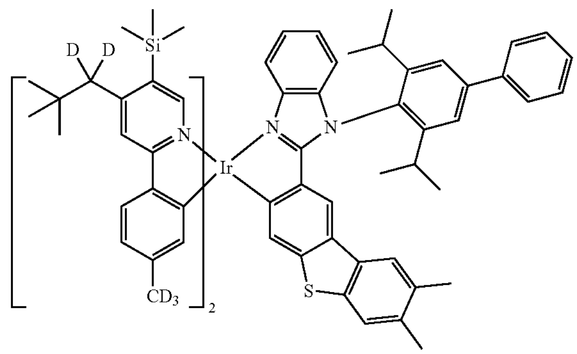
1547
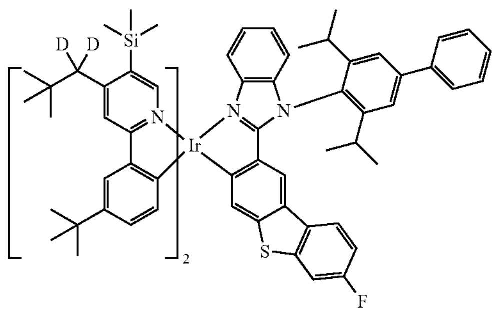
1548
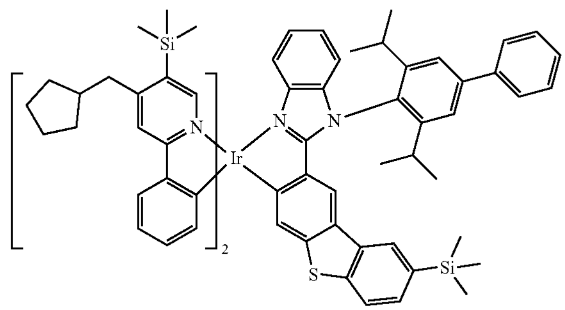
1549
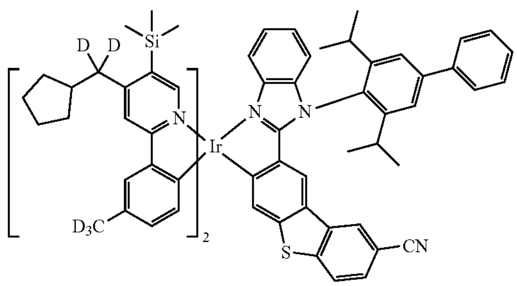
1550
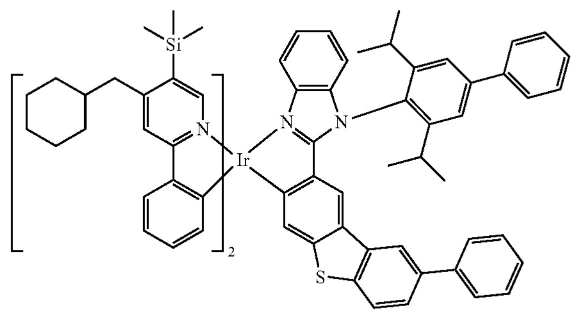
1551
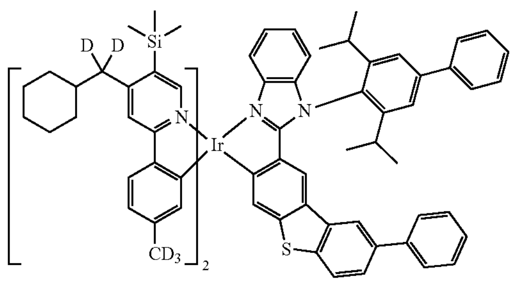
1552
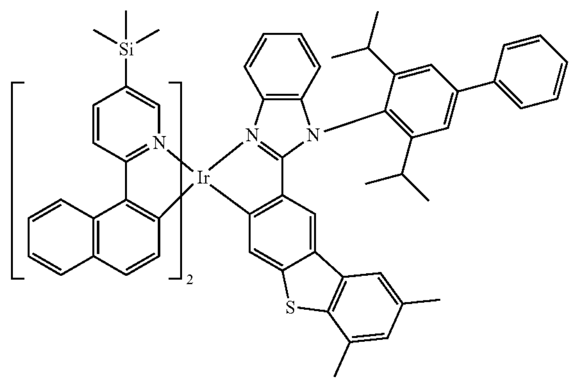

-continued
1553
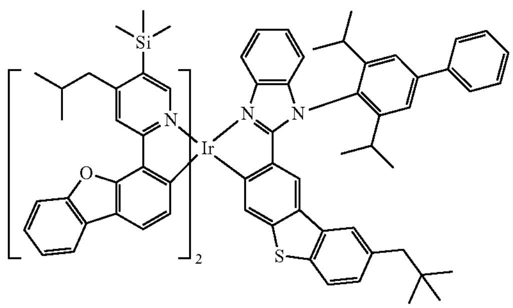
1554
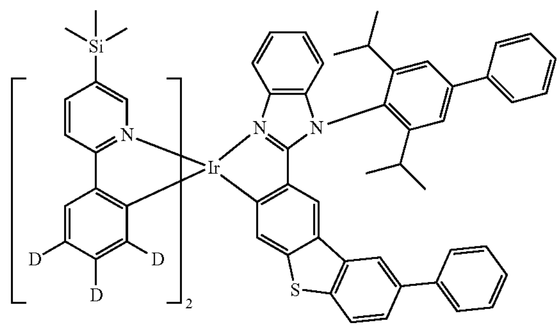
1555
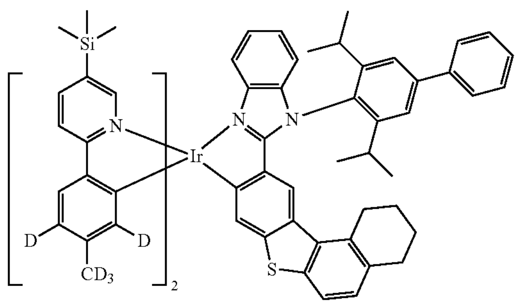
1556
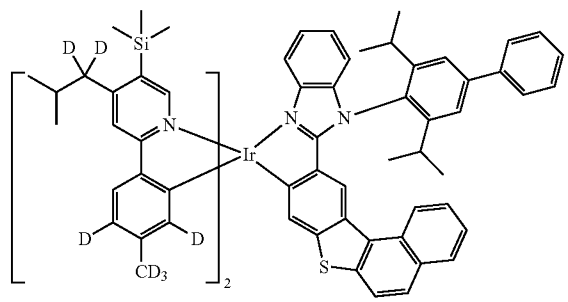
1557
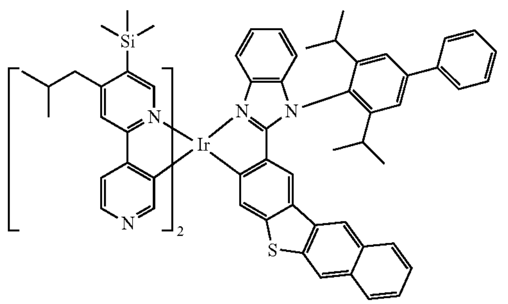
1558
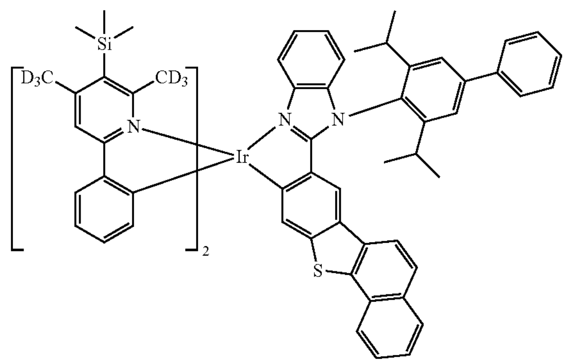
1559
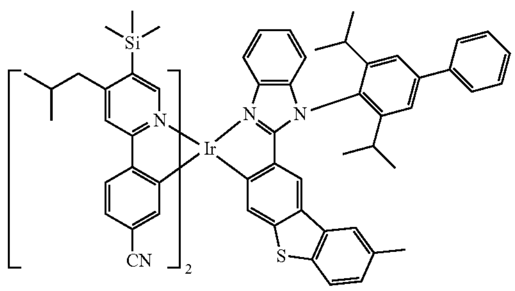
1560
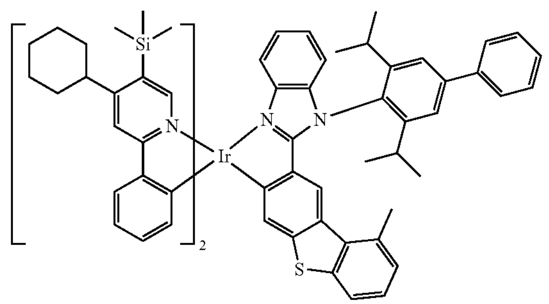

-continued
1561
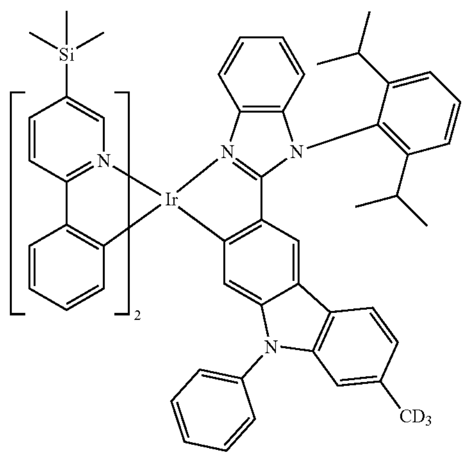
1562
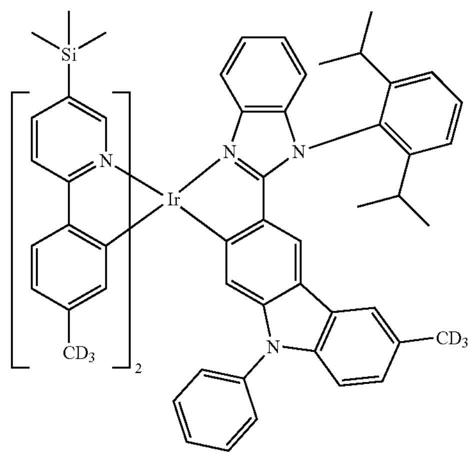
1563
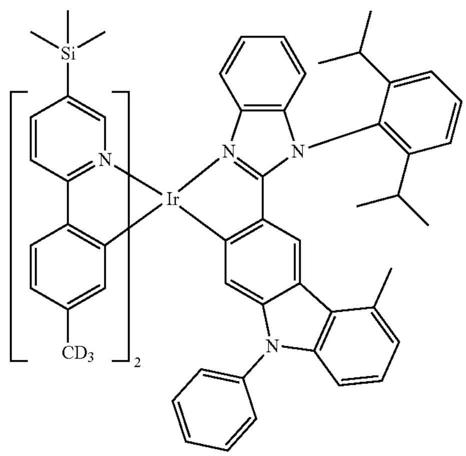
1564
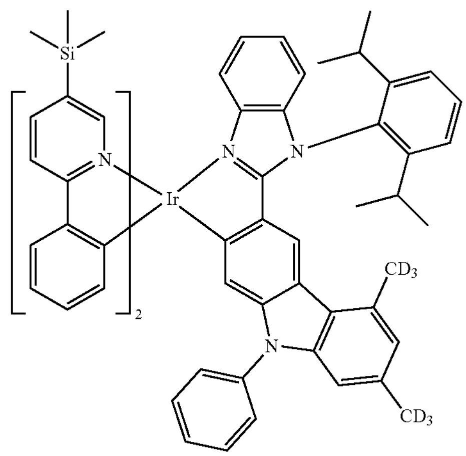
1565
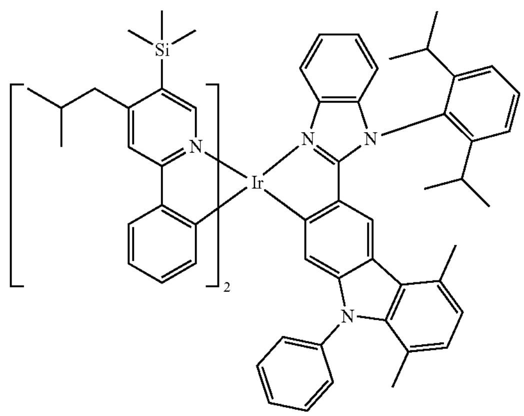
1566
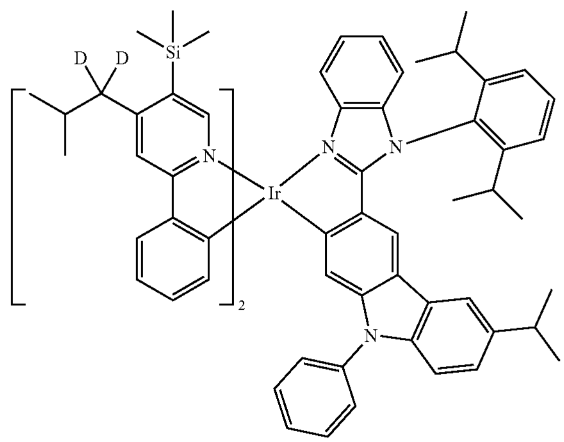

-continued
1567
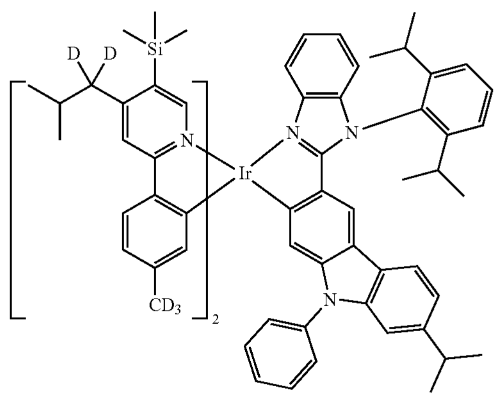
1568
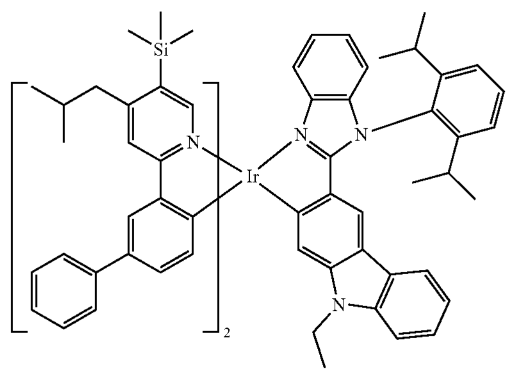
1569
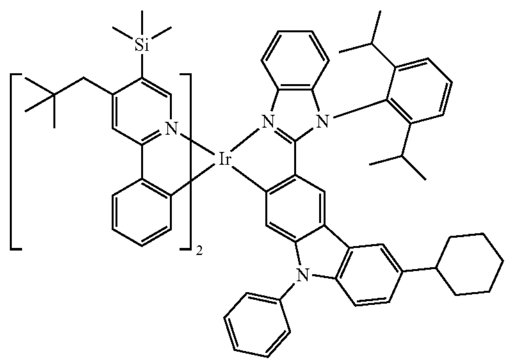
1570
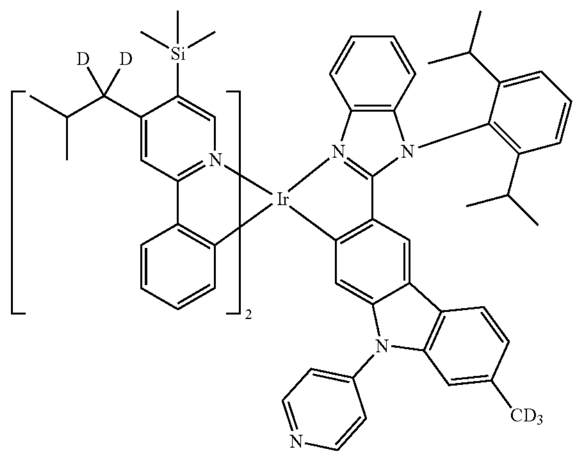
1571
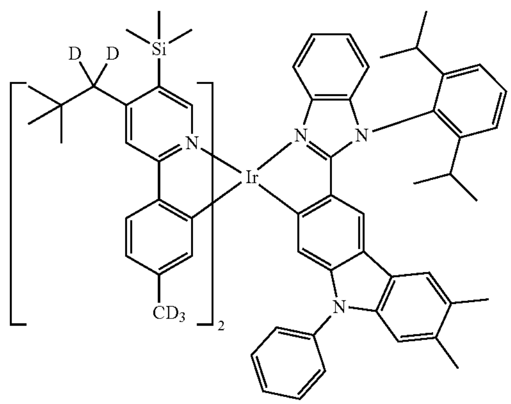
1572
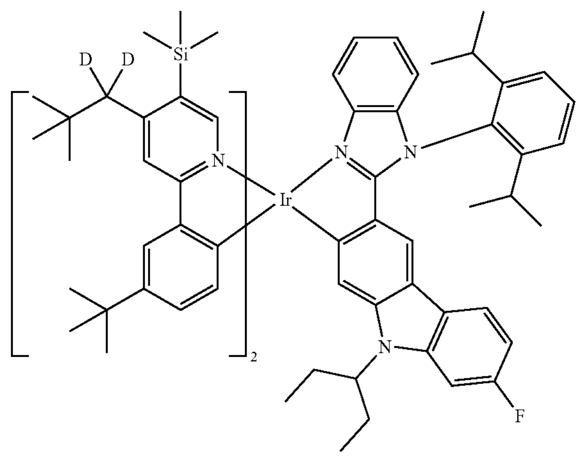

-continued
1573
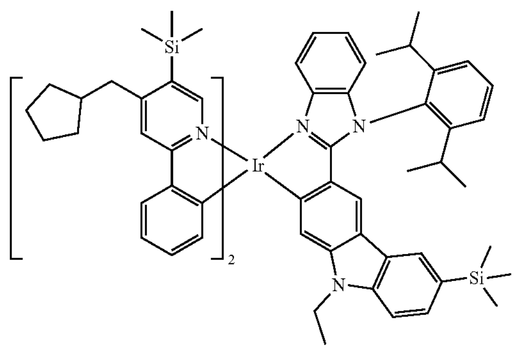
1574
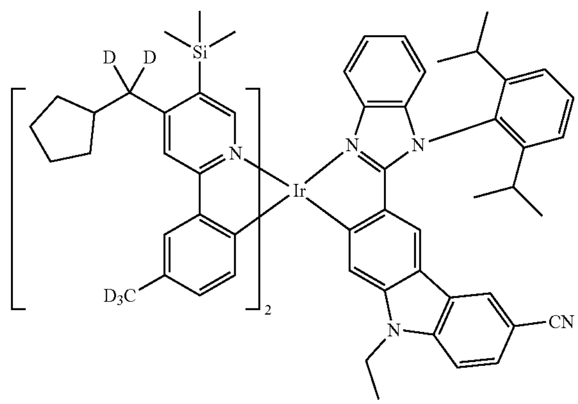
1575
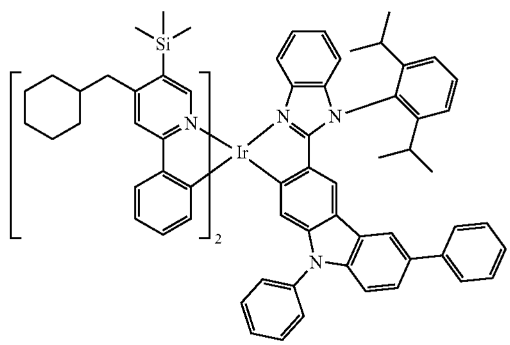
1576
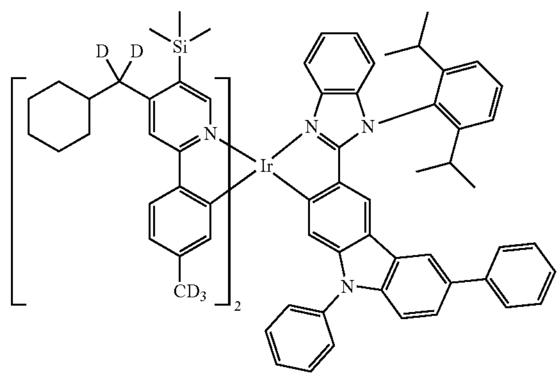
1577
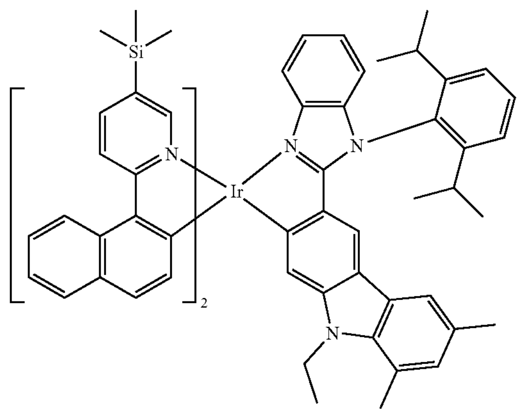
1578
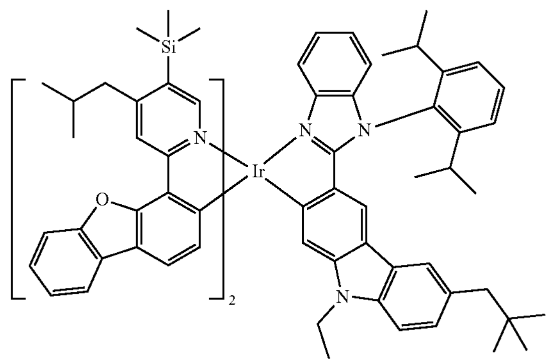

-continued
1579
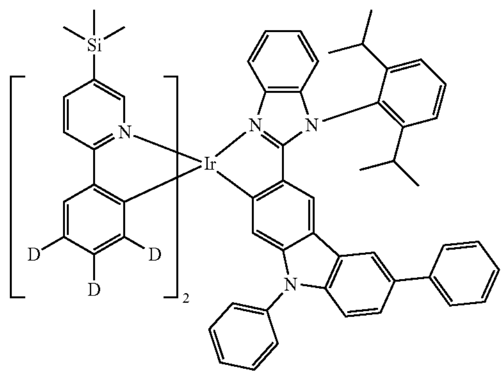
1580
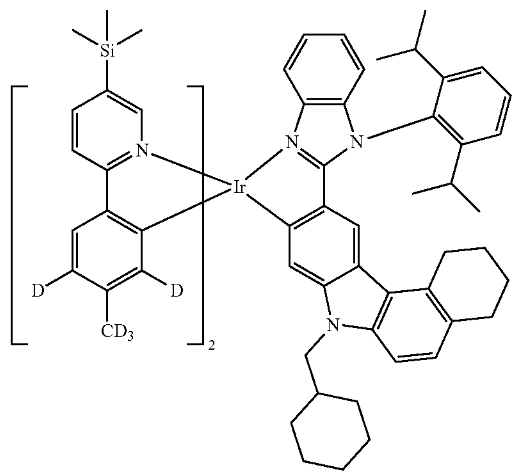
1581
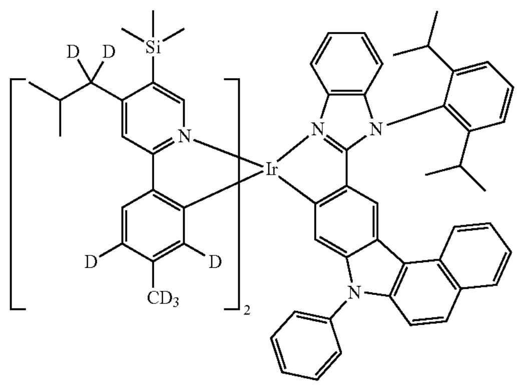
1582
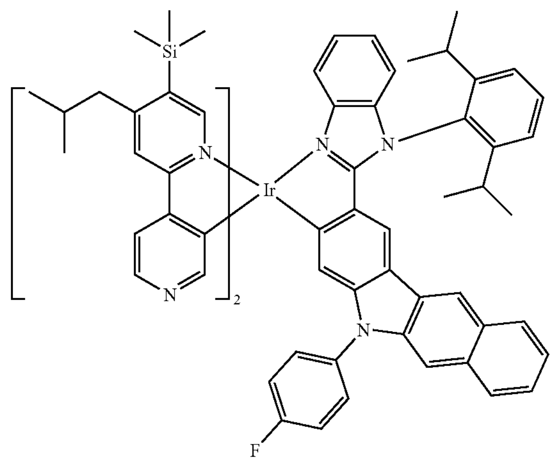
1583
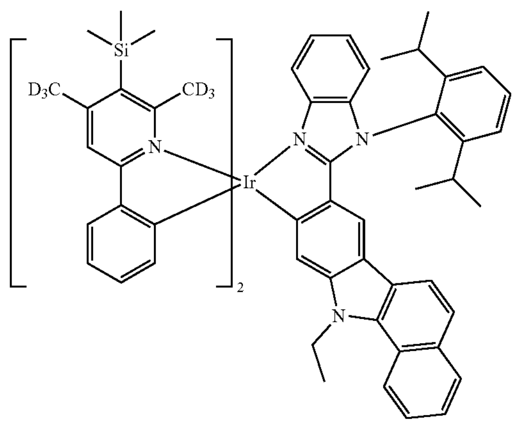
1584
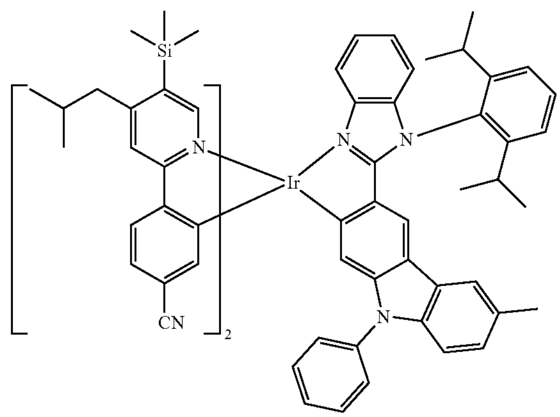

-continued
1585
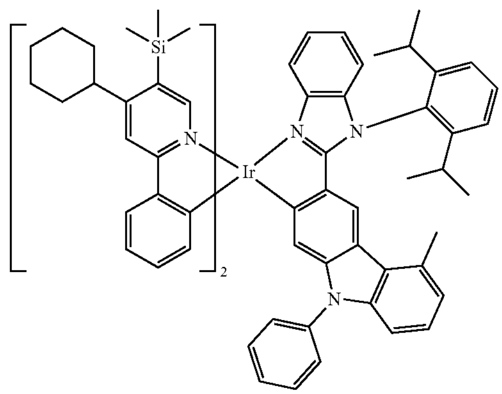
1586
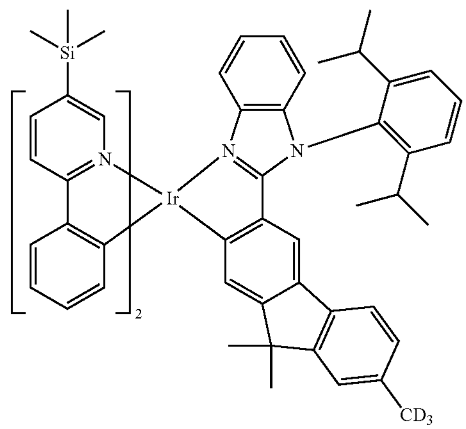
1587
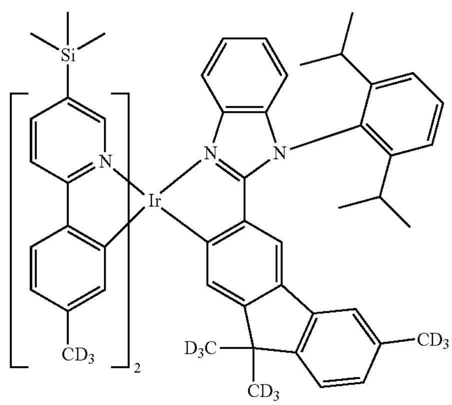
1588
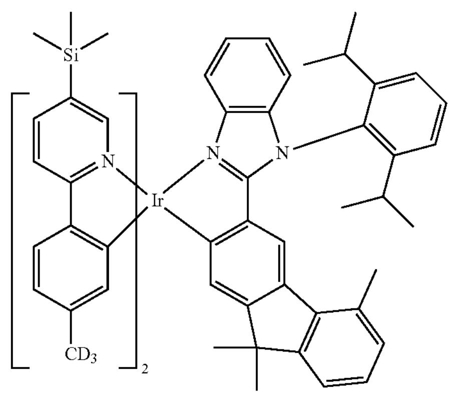
1589
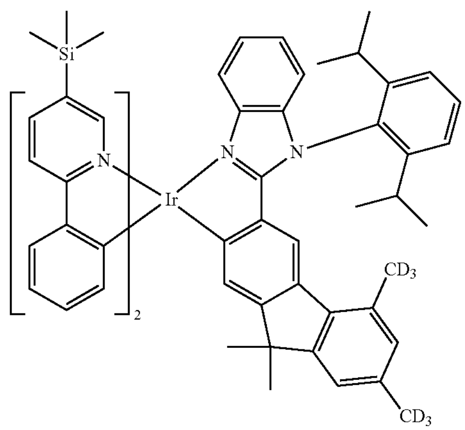
1590
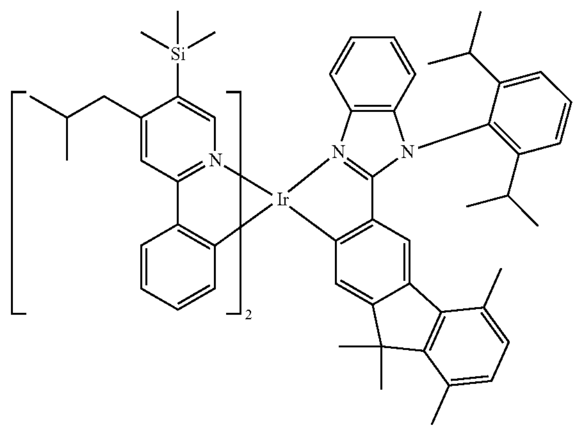

-continued
1591
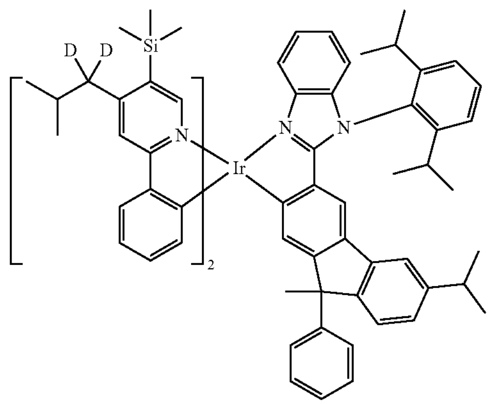
1592
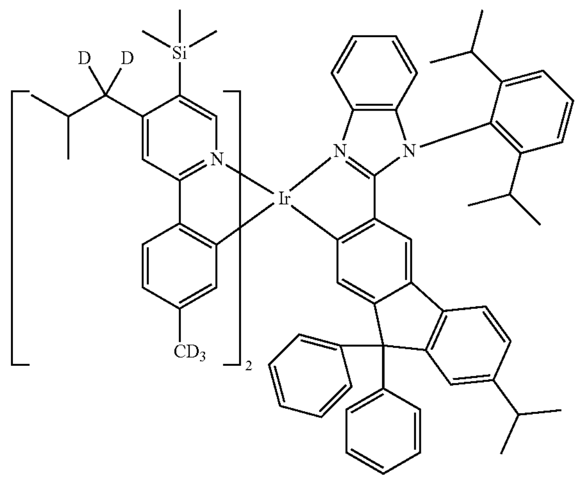
1593
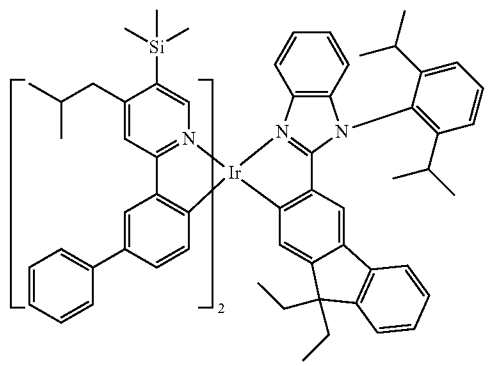
1594
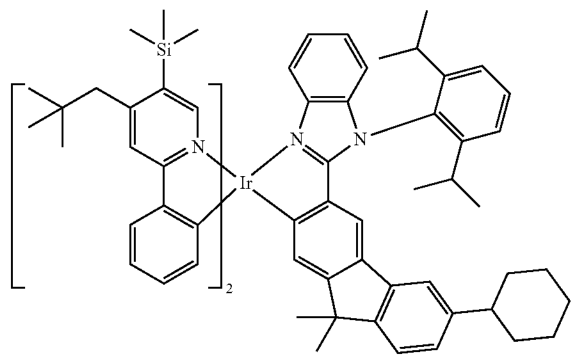
1595
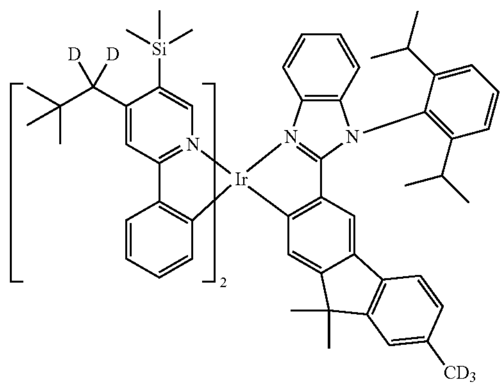
1596
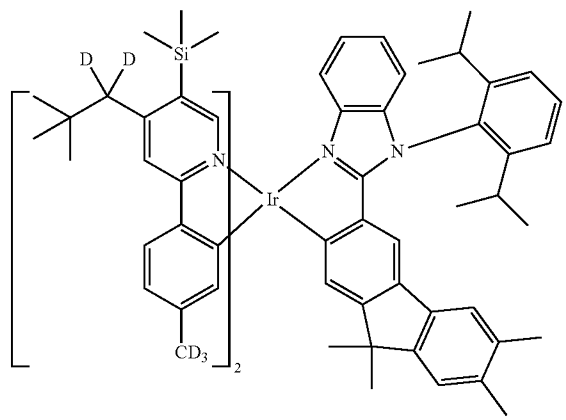

-continued
1597
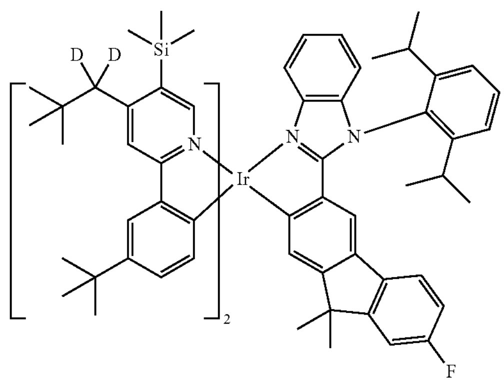
1598
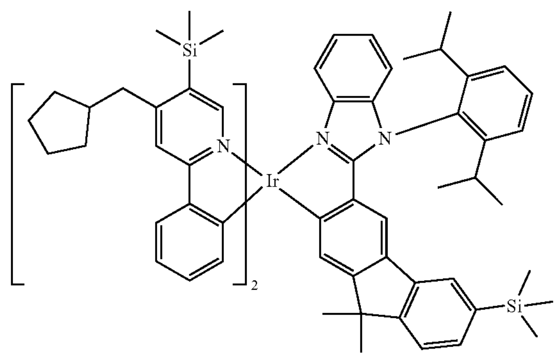
1599
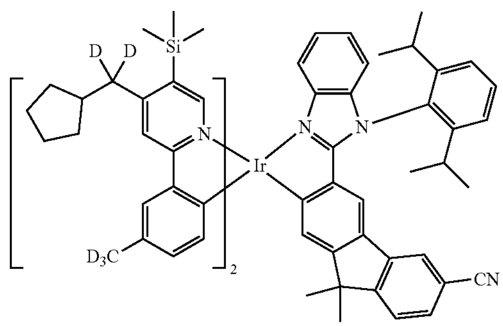
1600
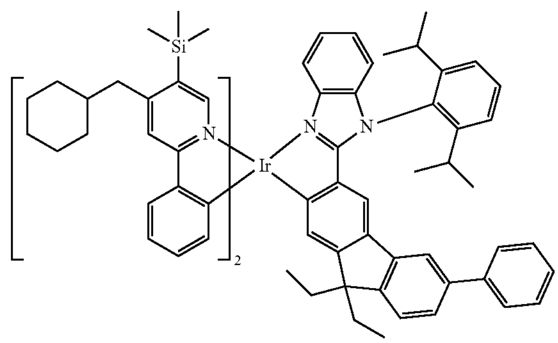
1601
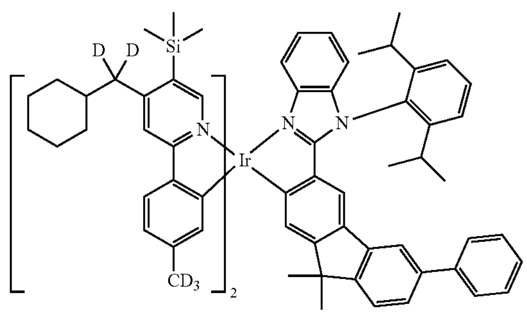
1602
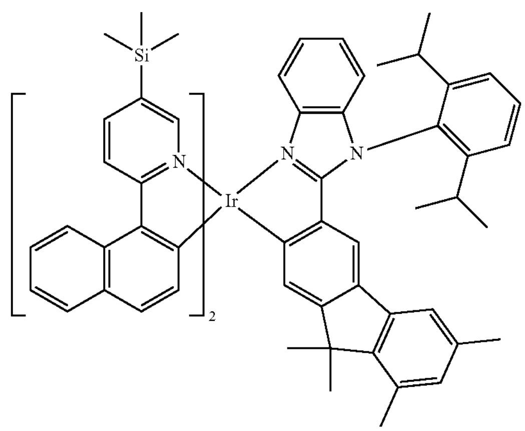
1603
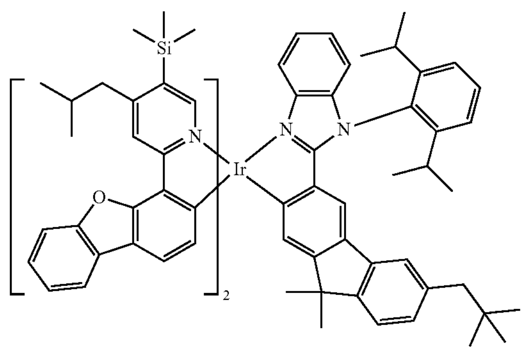
1604
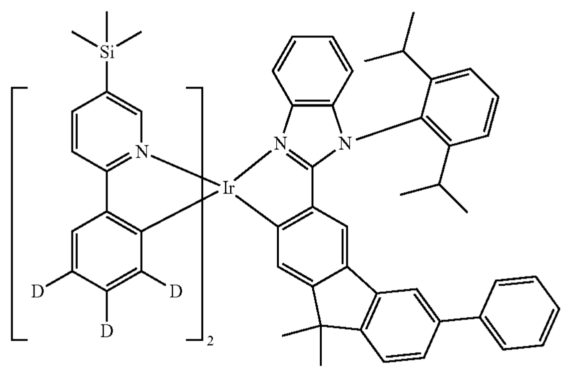

-continued
1605
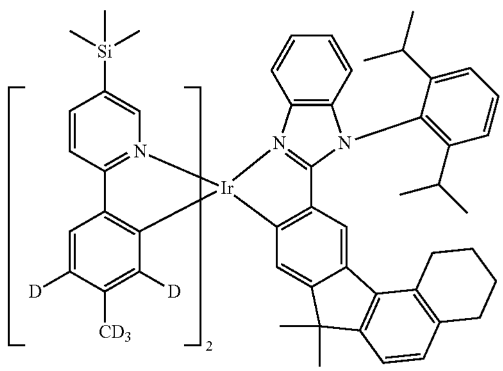
1606
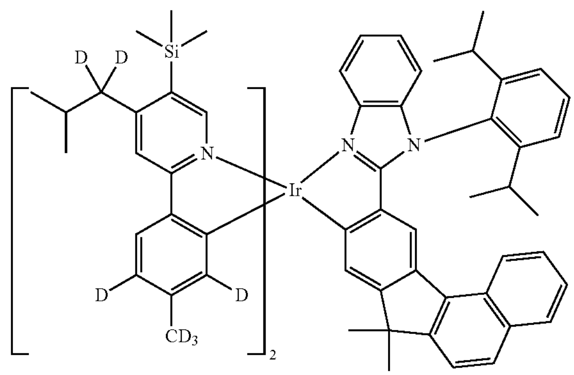
1607
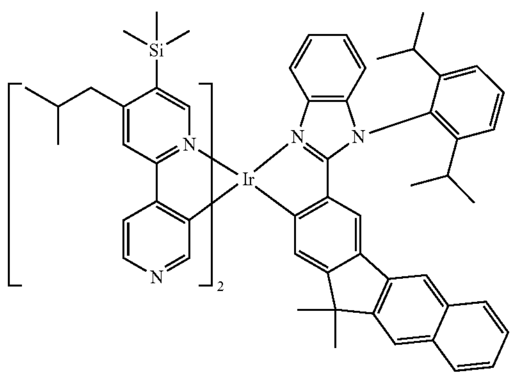
1608
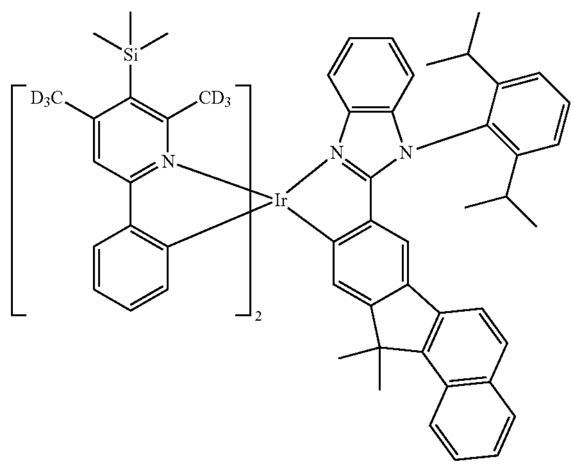
1609
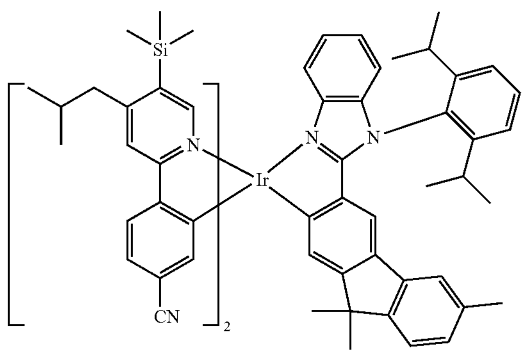
1610
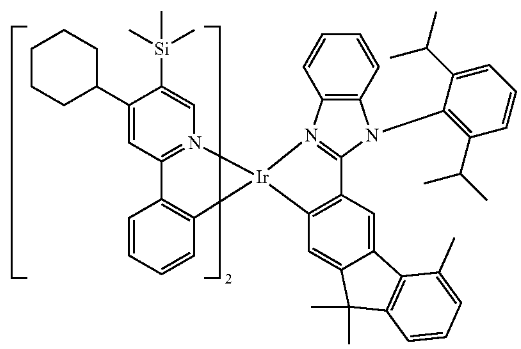
1611
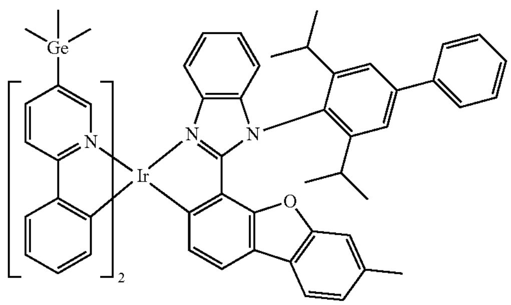
1612
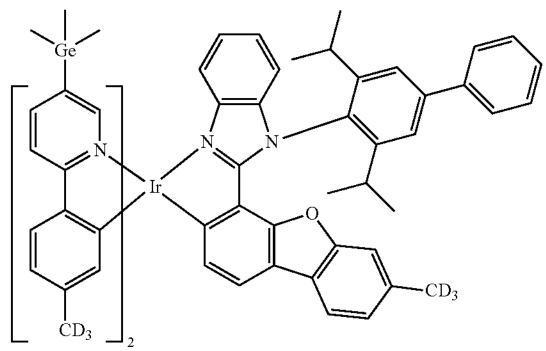

-continued
1613
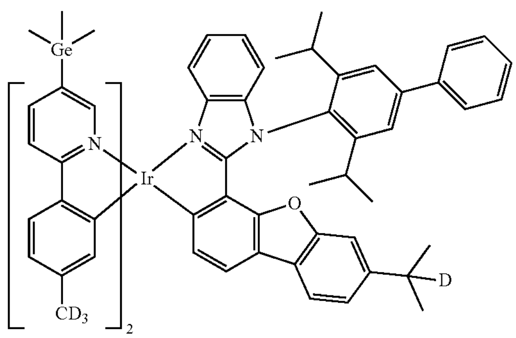
1614
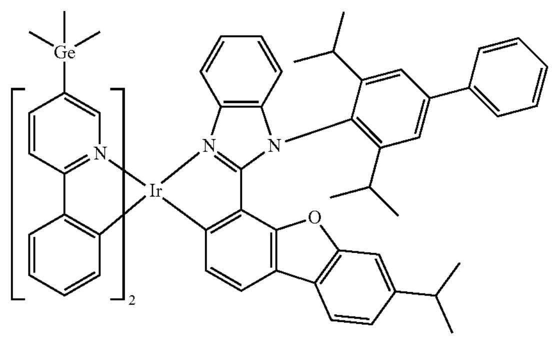
1615
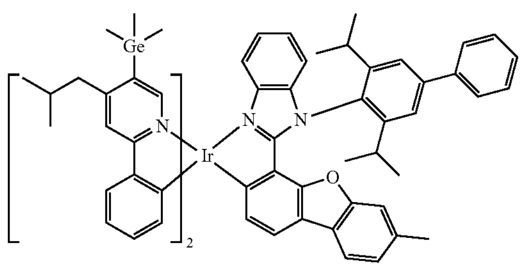
1616
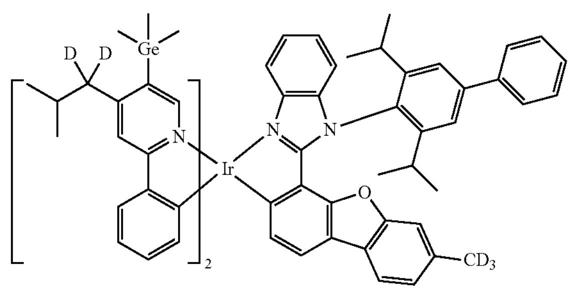
1617
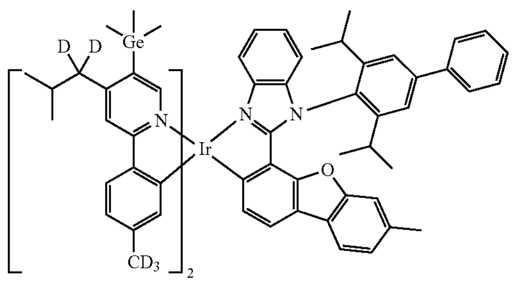
1618
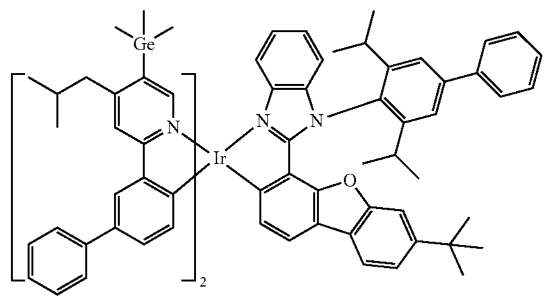
1619
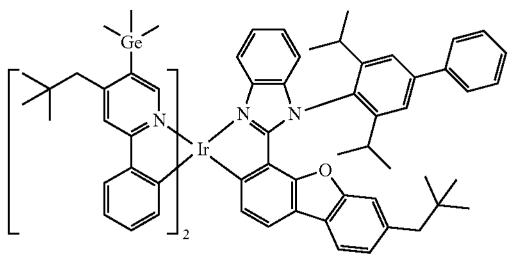
1620
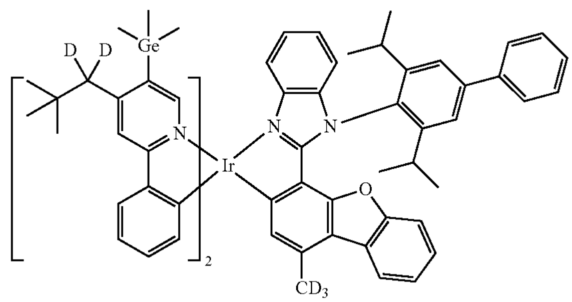
1621
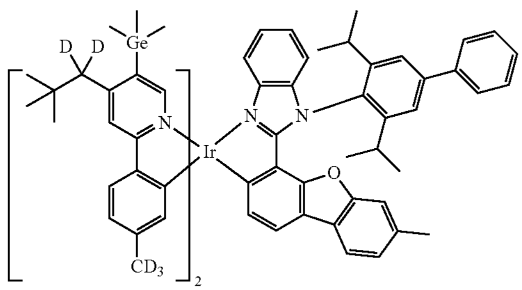
1622
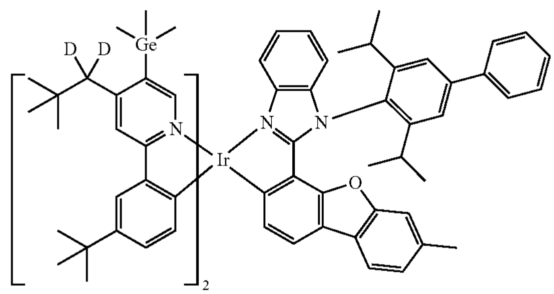

-continued
1623
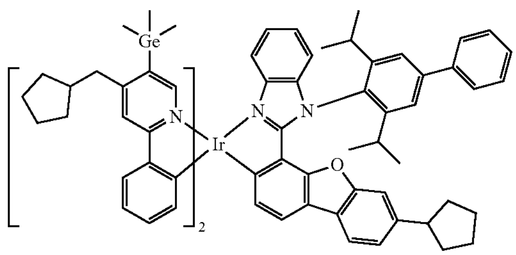
1624
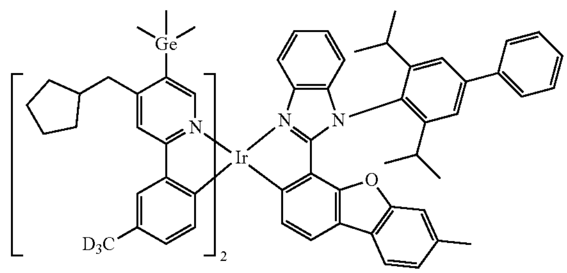
1625
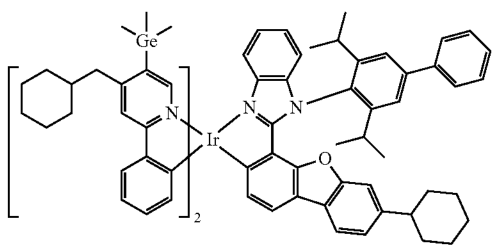
1626
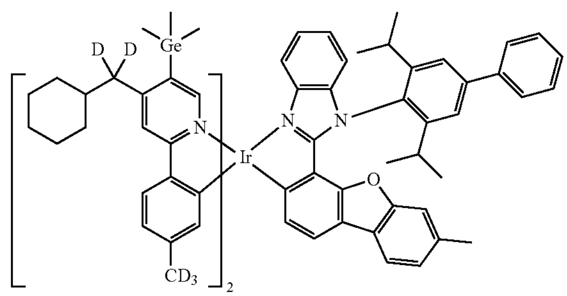
1627
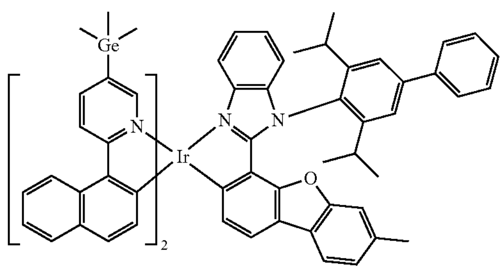
1628
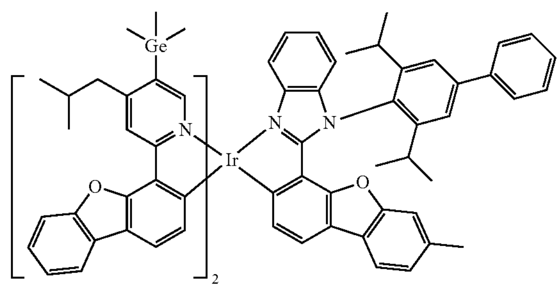
1629
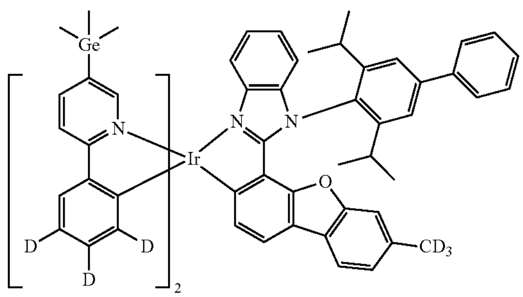
1630
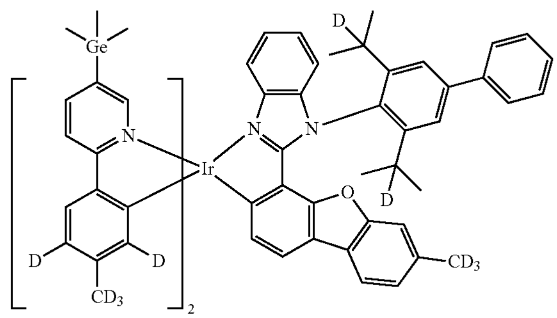
1631
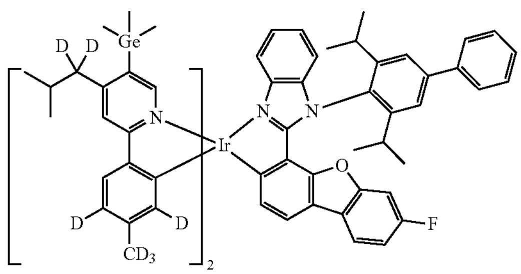
1632
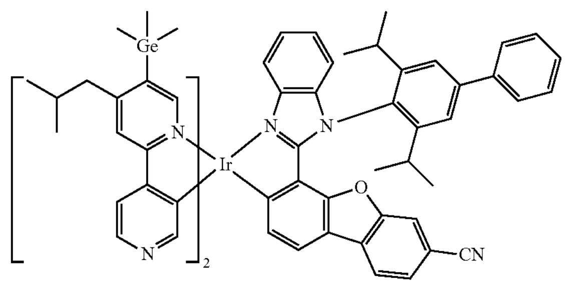

-continued
1633
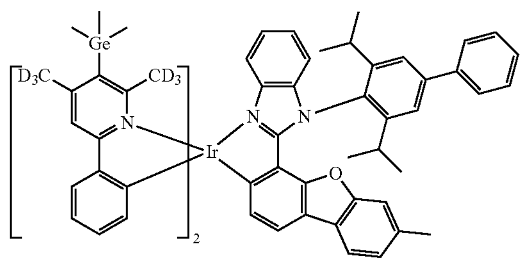
1634
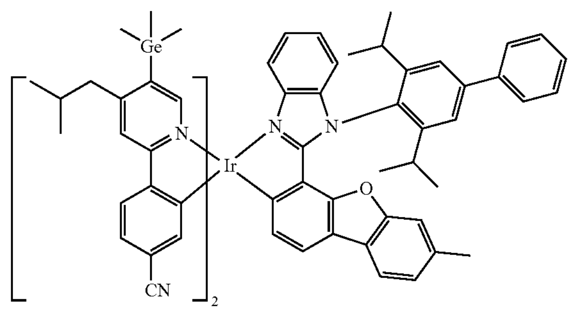
1635
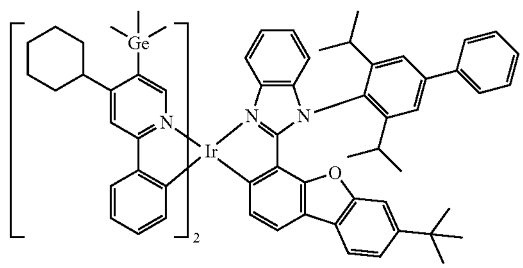
1636
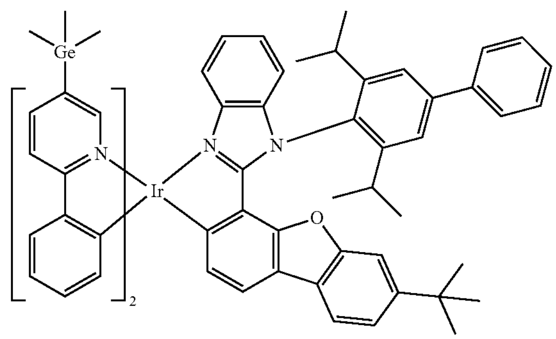
1637
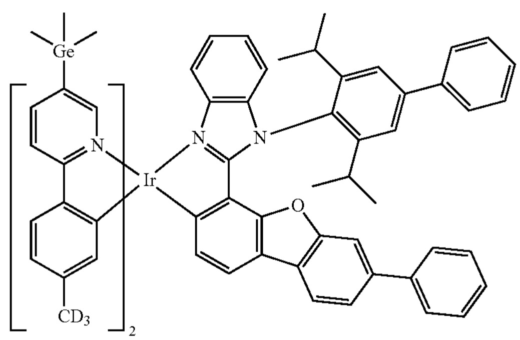
1638
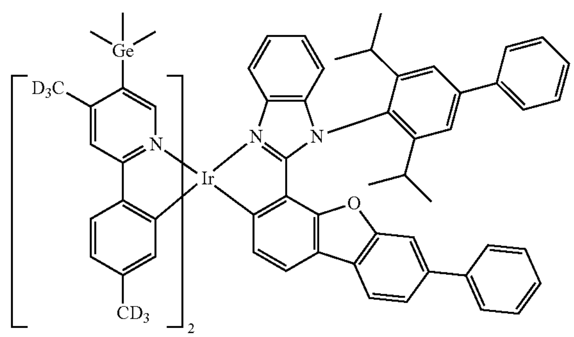
1639
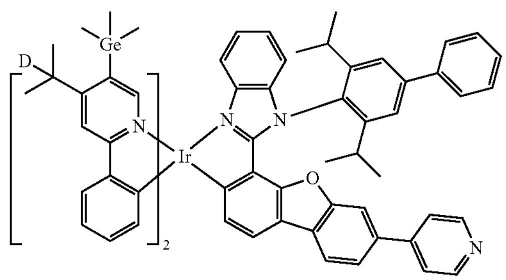
1640
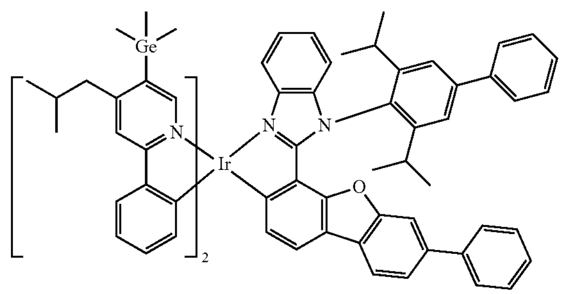

-continued
1641
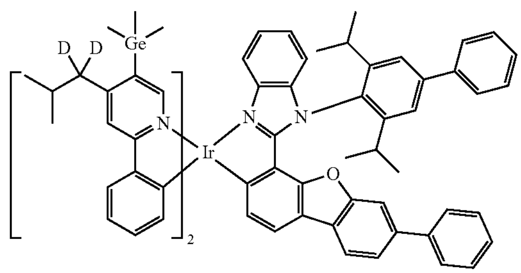
1642
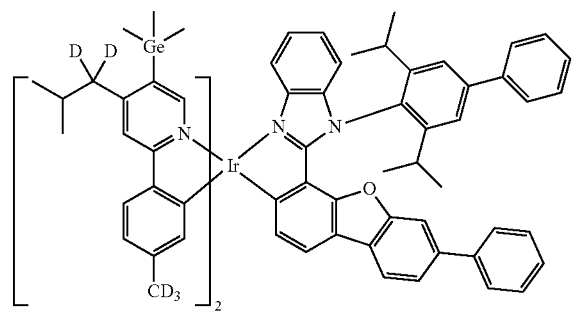
1643
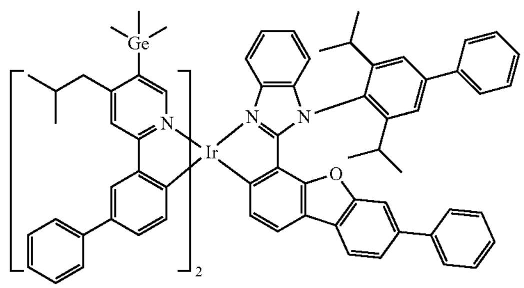
1644
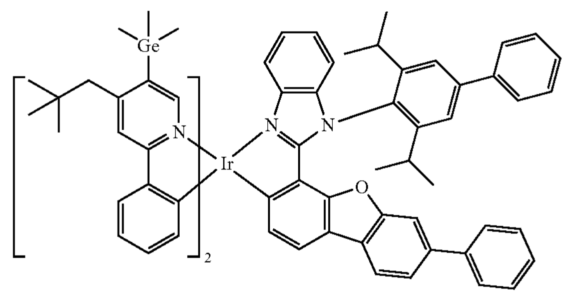
1645
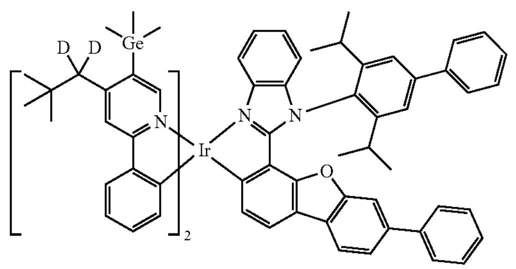
1646
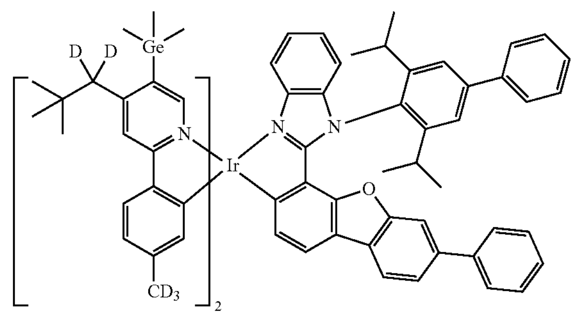
1647
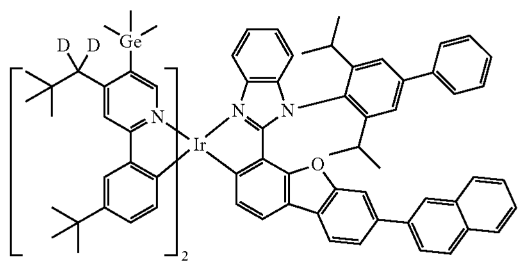
1648
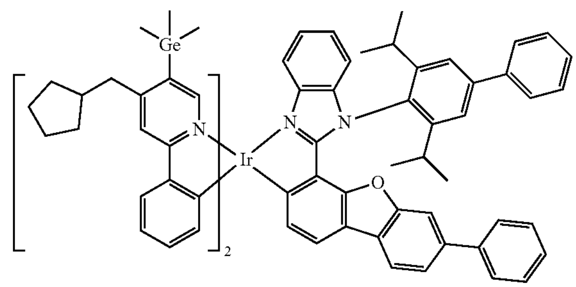
1649
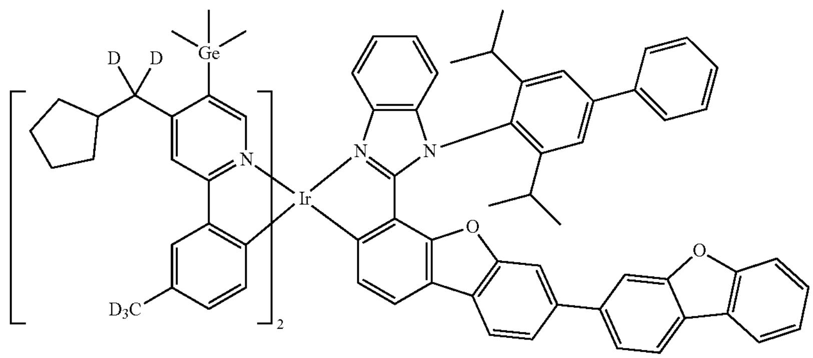

-continued
1650
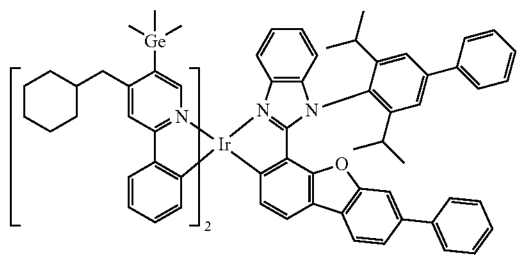
1651
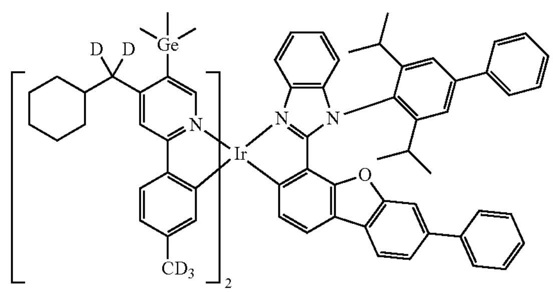
1652
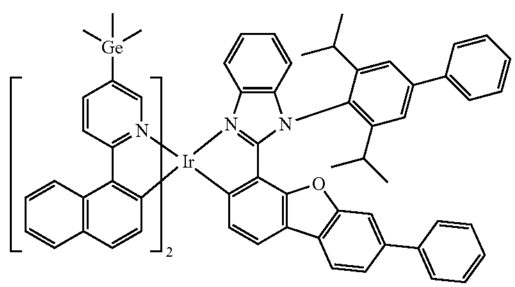
1653
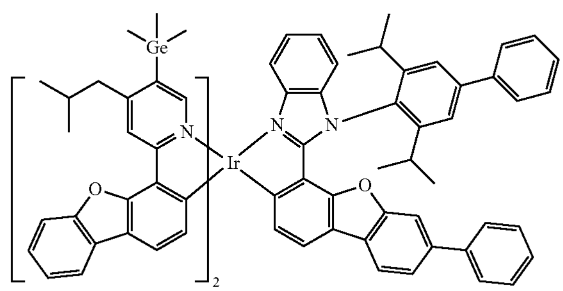
1654
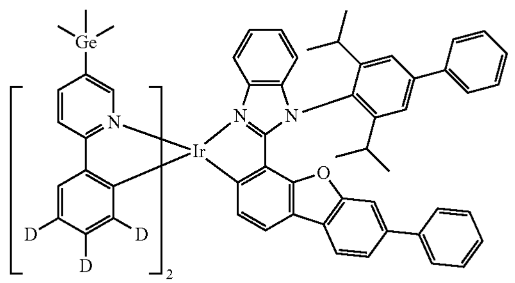
1655
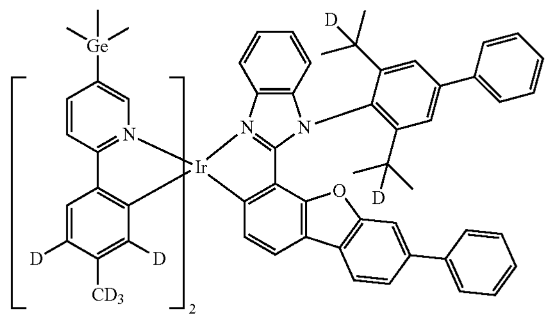
1656
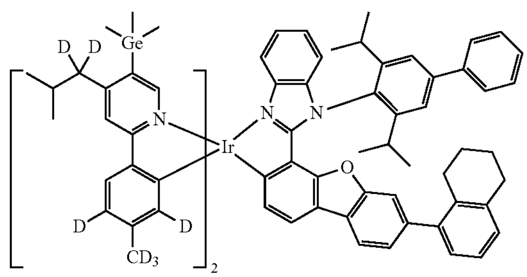
1657
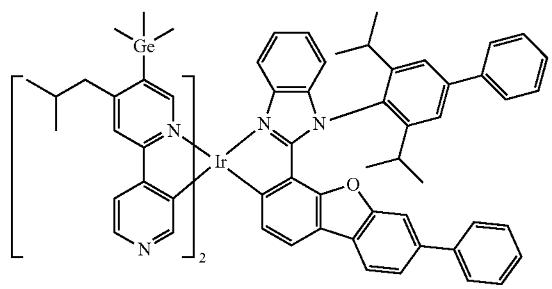
1658
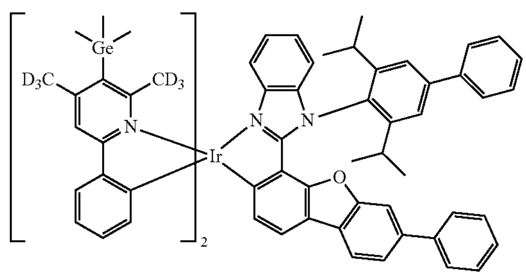
1659
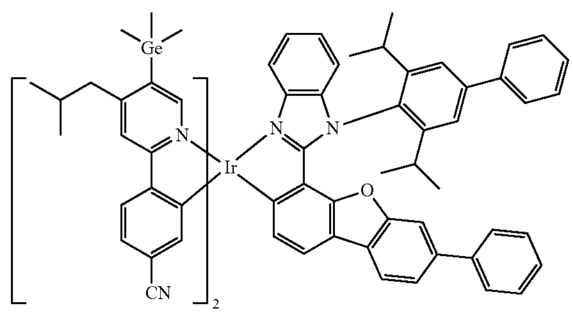

-continued
1660
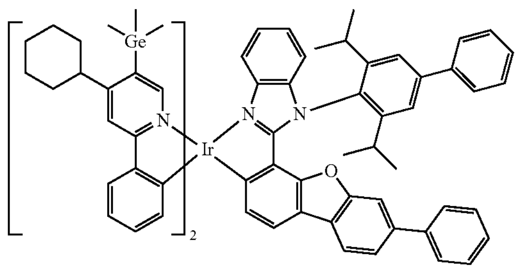
1661
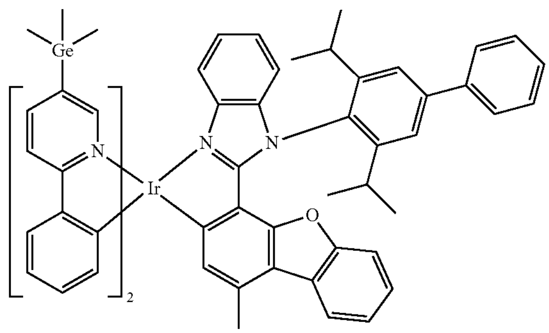
1662
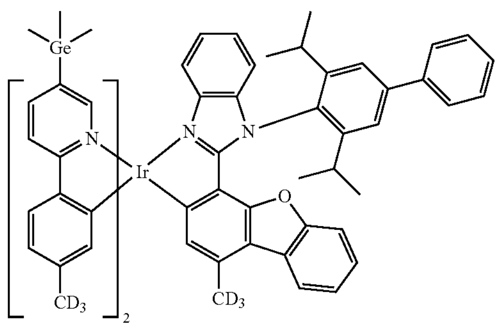
1663
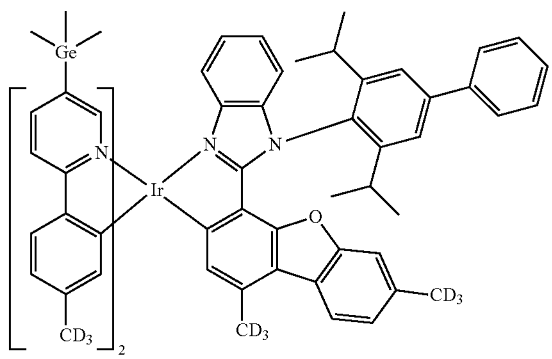
1664
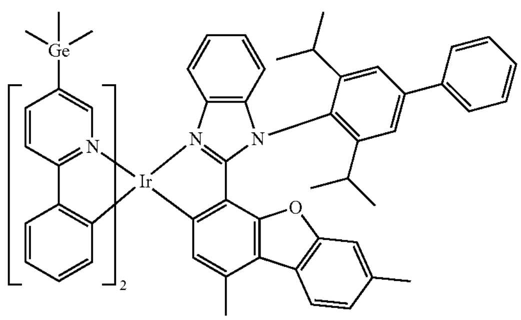
1665
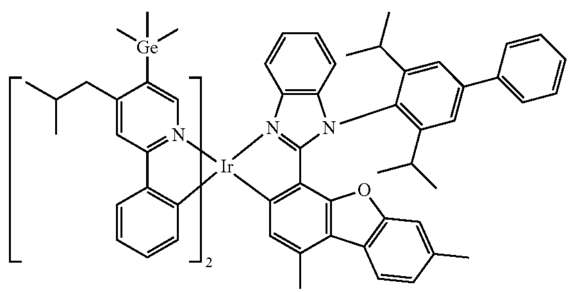
1666
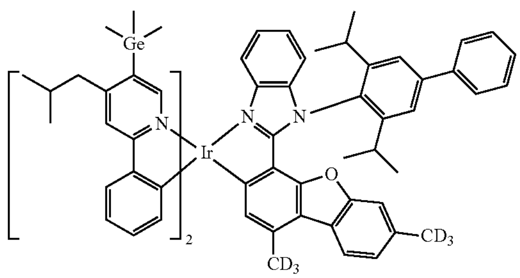
1667
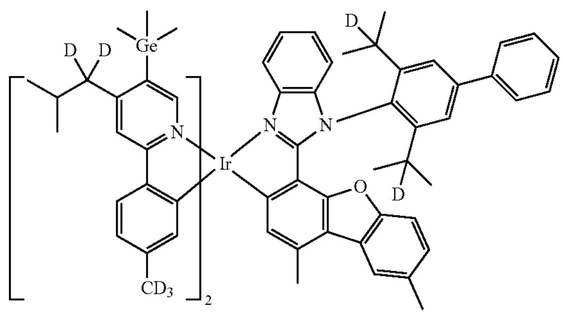

-continued
1668
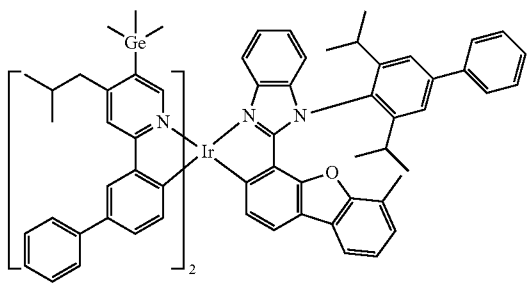
1669
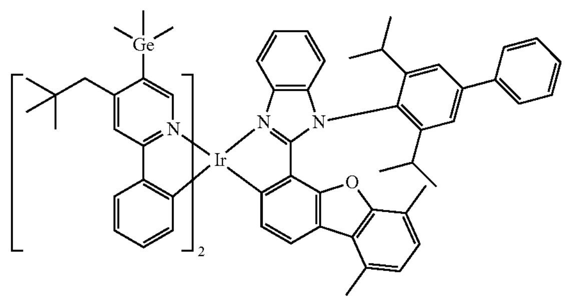
1670
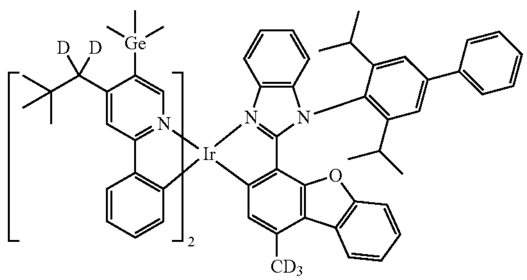
1671
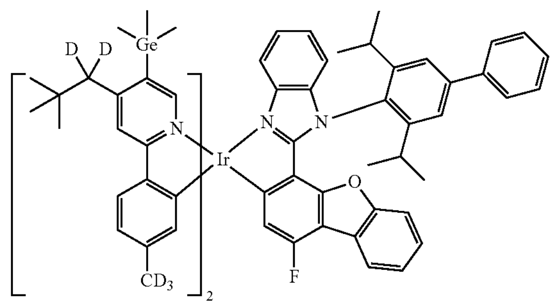
1672
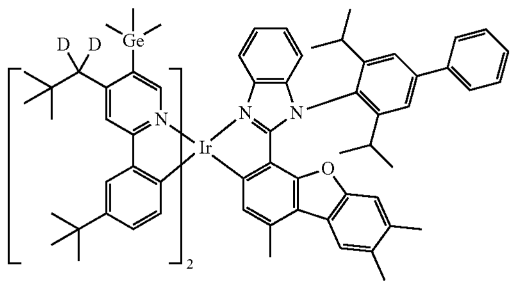
1673
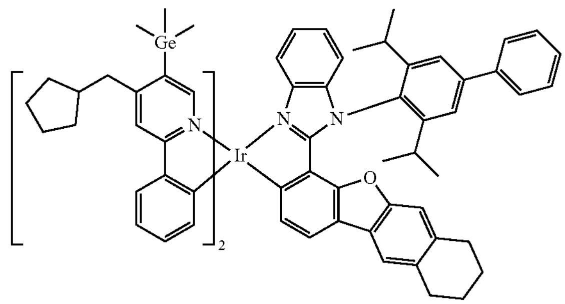
1674
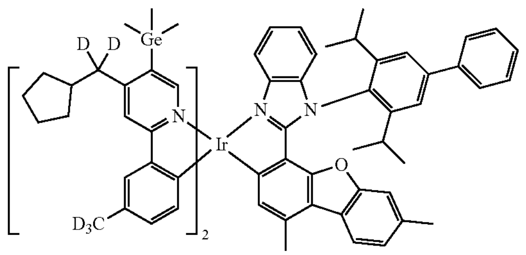
1675
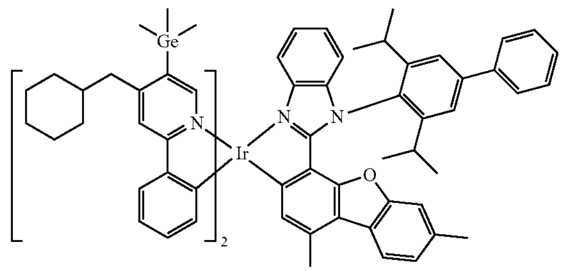
1676
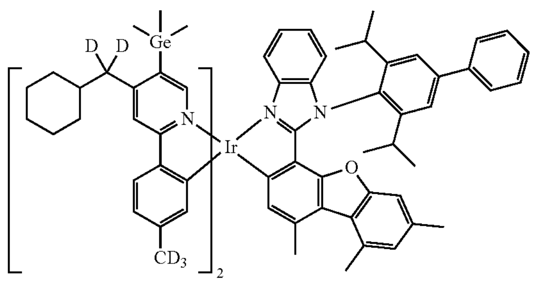
1677
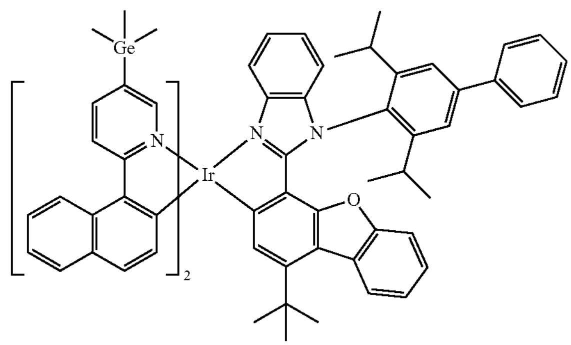

-continued
1678
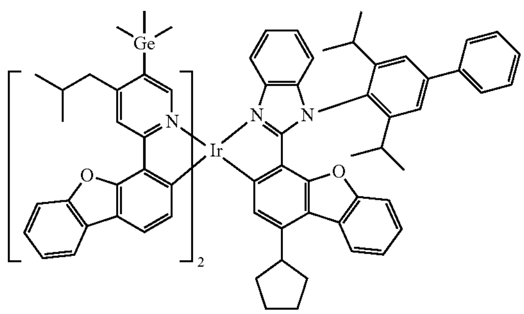
1679
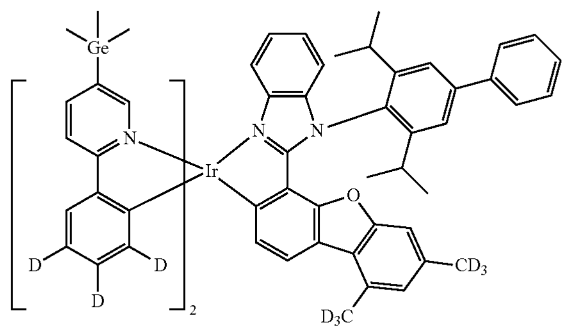
1680
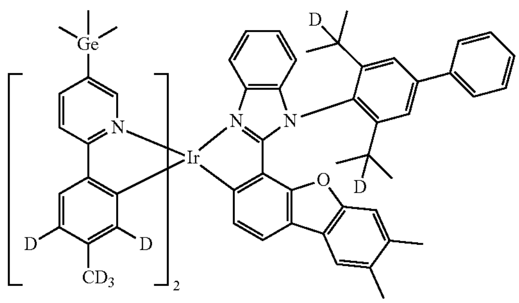
1681
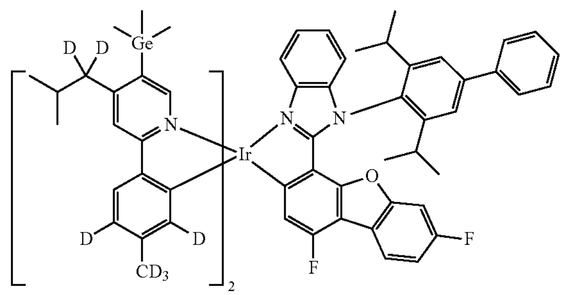
1682
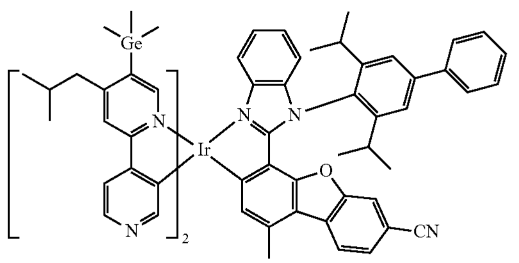
1683
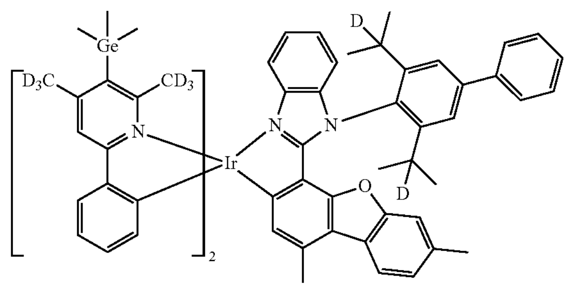
1684
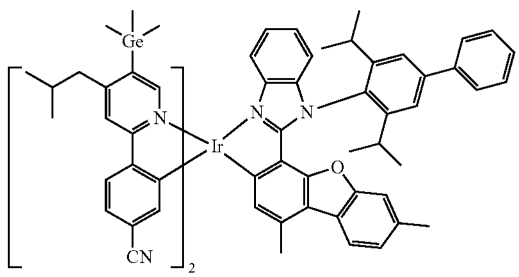
1685
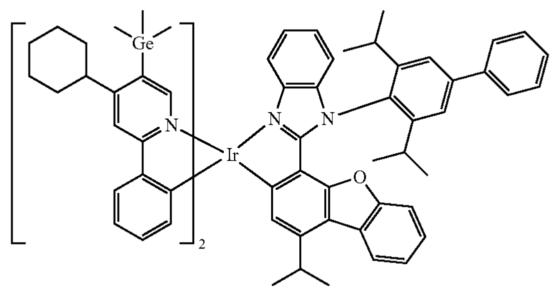

-continued
1686
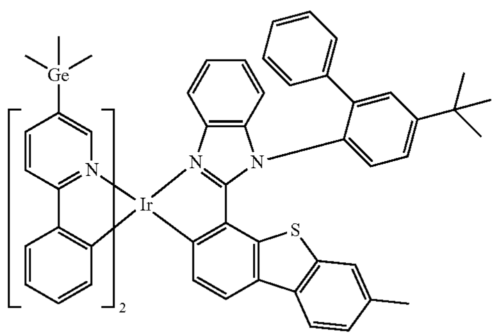
1687
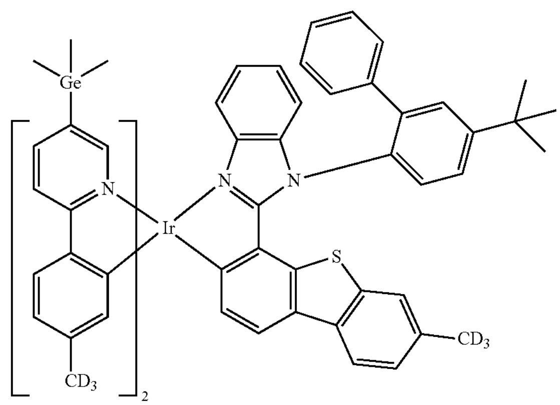
1688
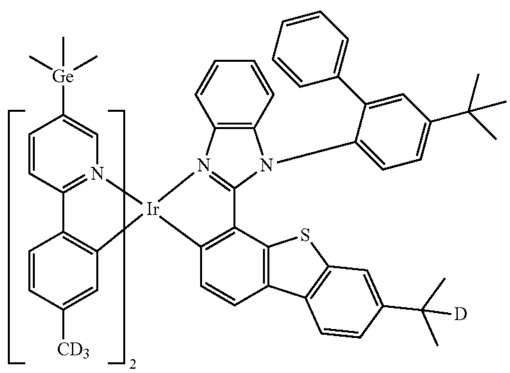
1689
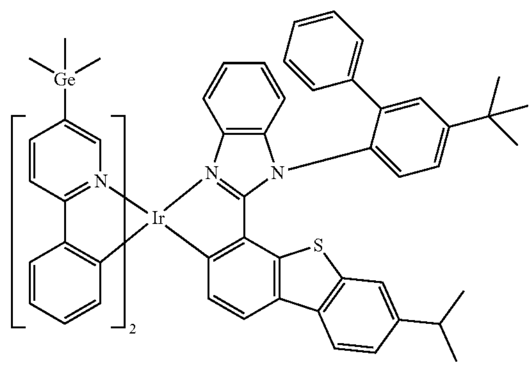
1690
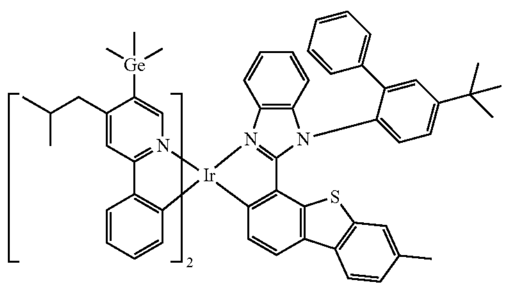
1691
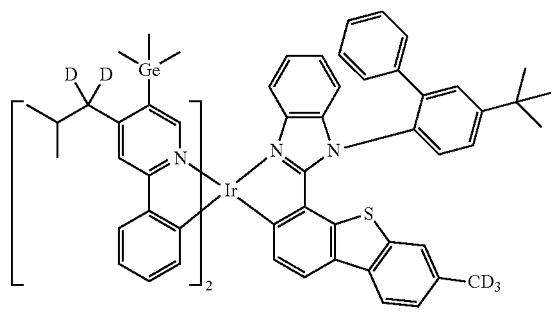
1692
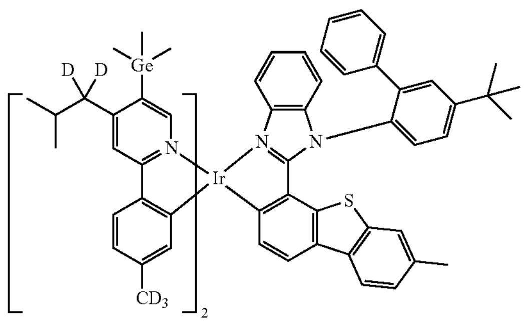
1693
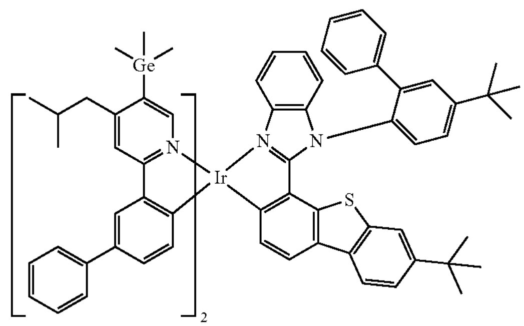

-continued
1694
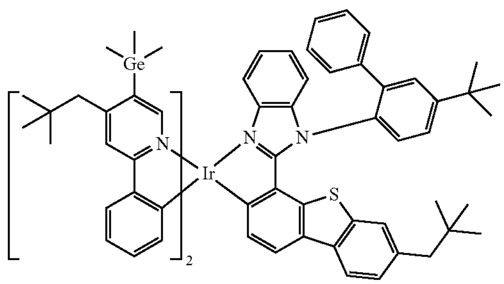
1695
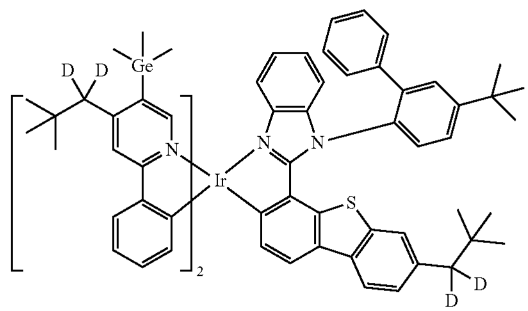
1696
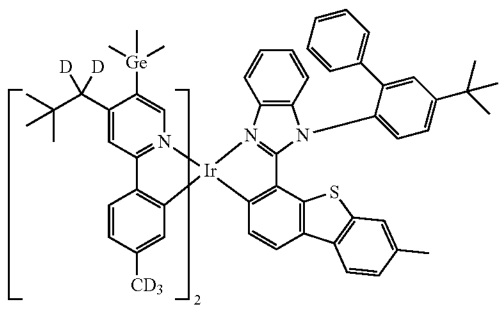
1697
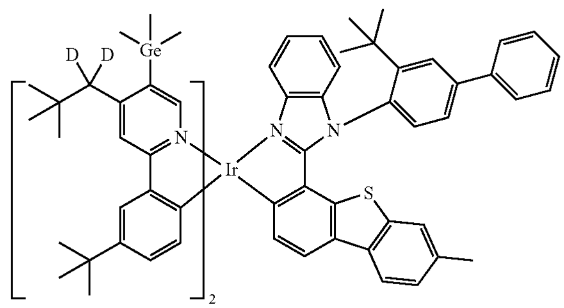
1698
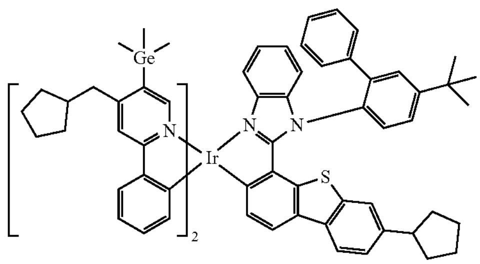
1699
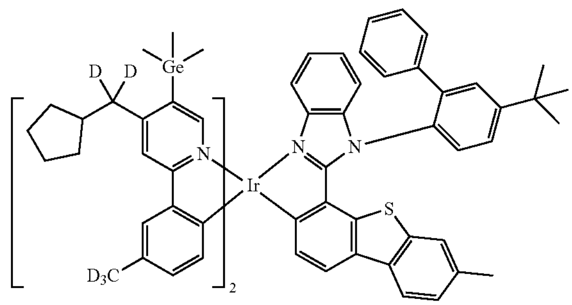
1700
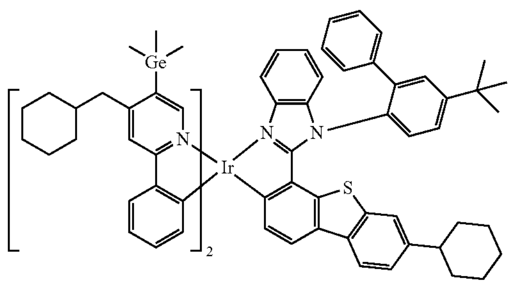
1701
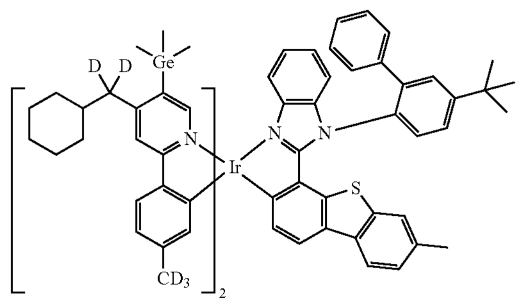
1702
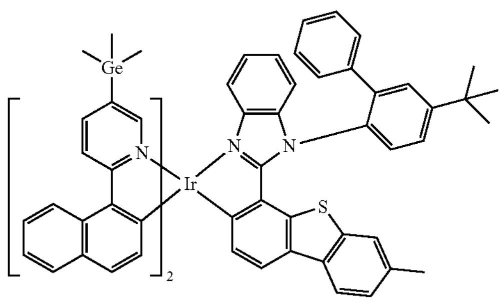
1703
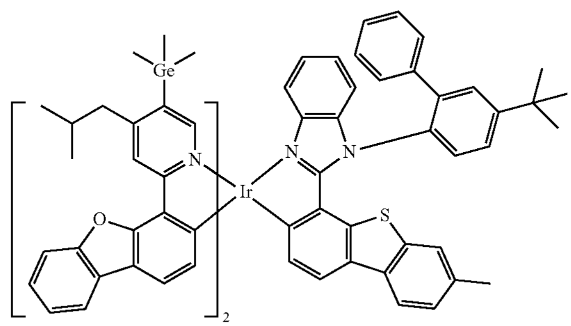

-continued
1704
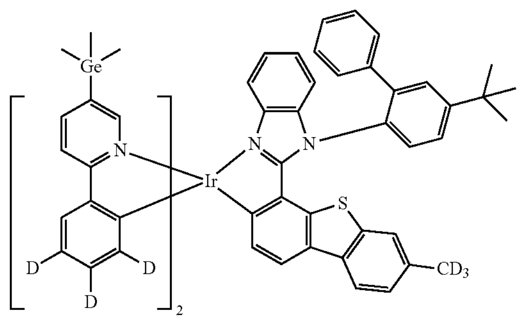
1705
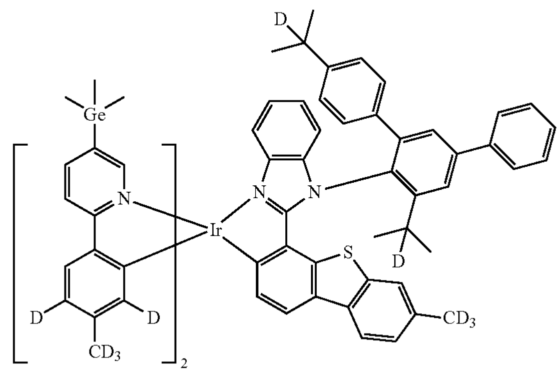
1706
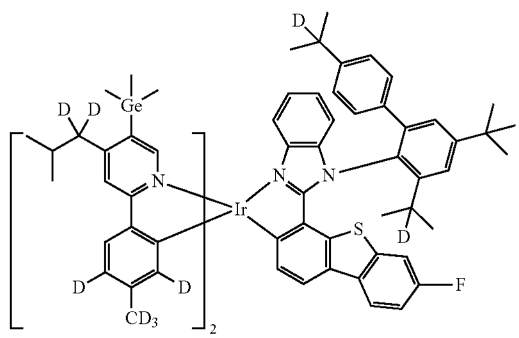
1707
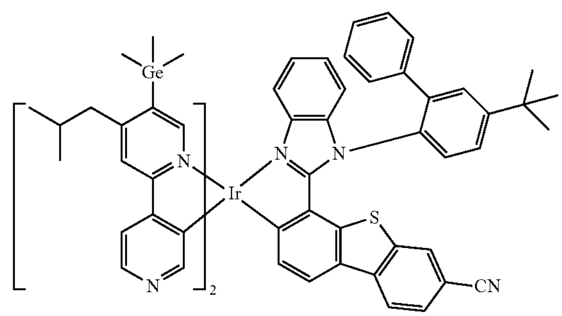
1708
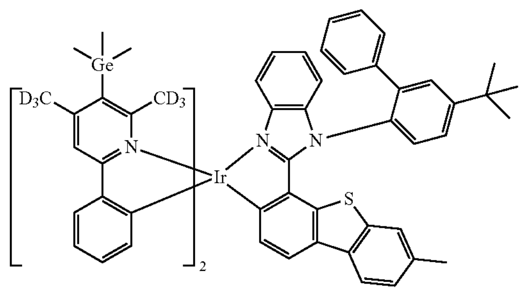
1709
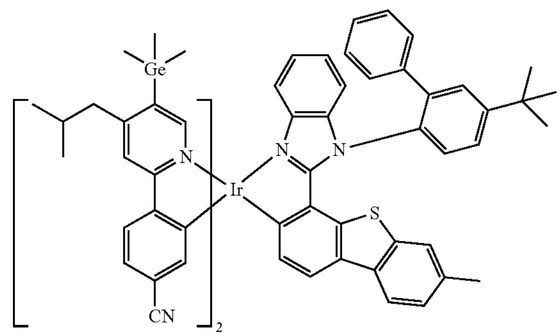
1710
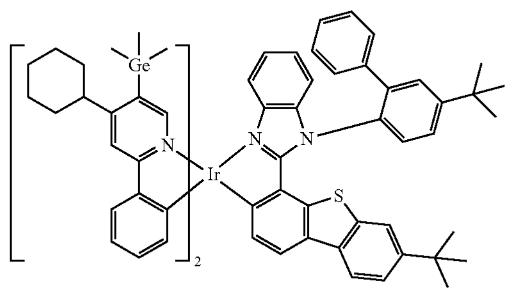
1711
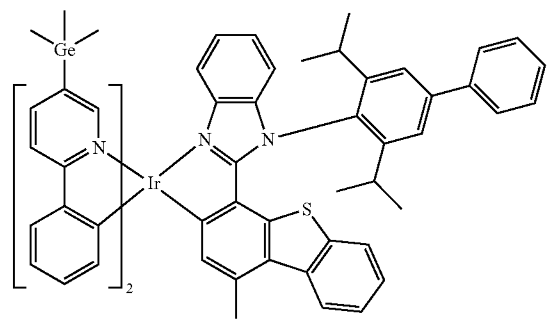

-continued
1712
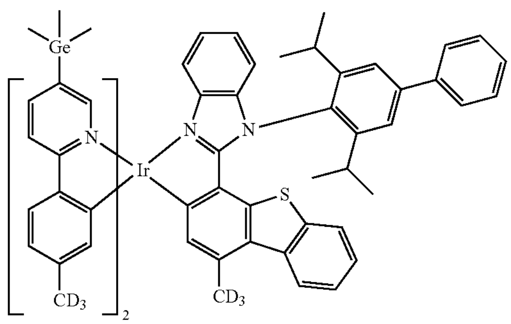
1713
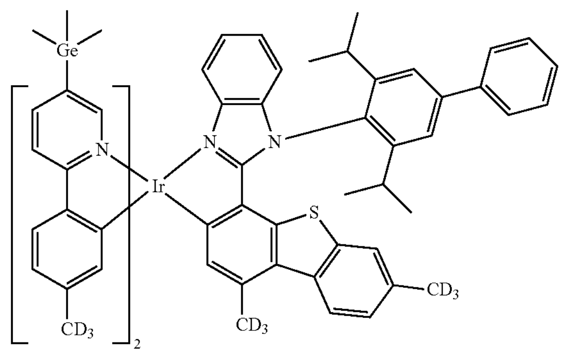
1714
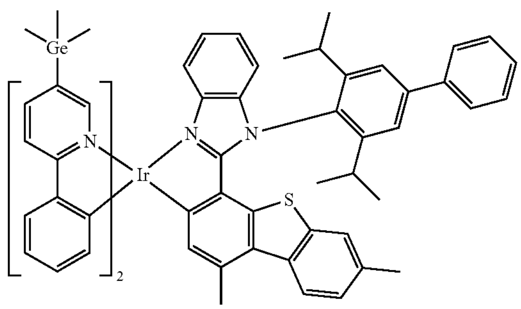
1715
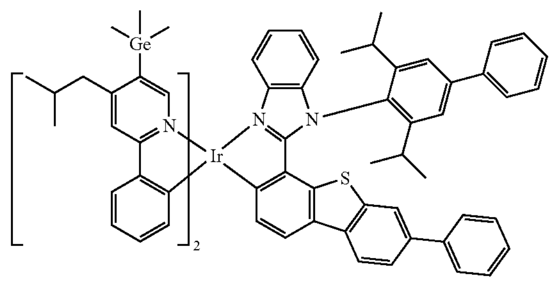
1716
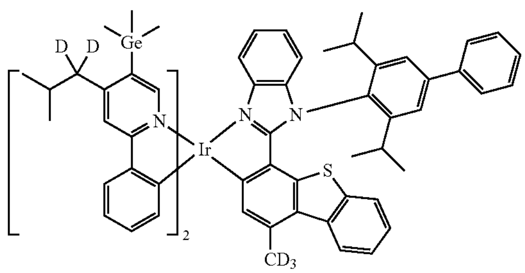
1717
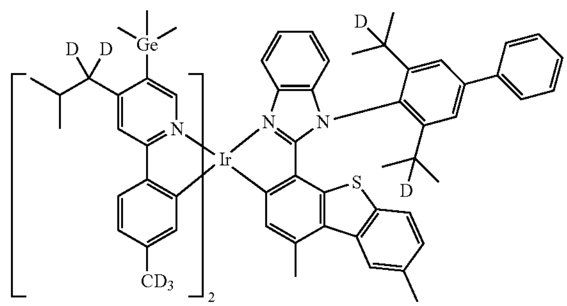
1718
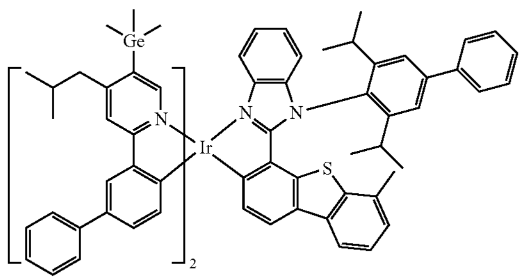
1719
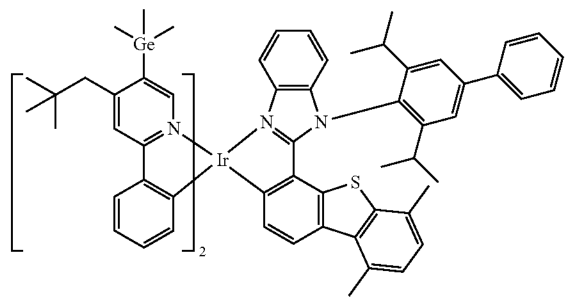

-continued
1720
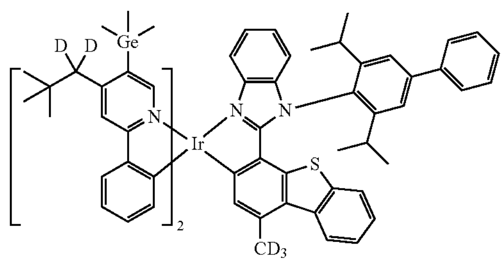
1721
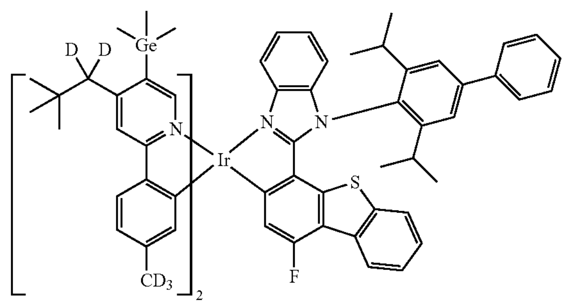
1722
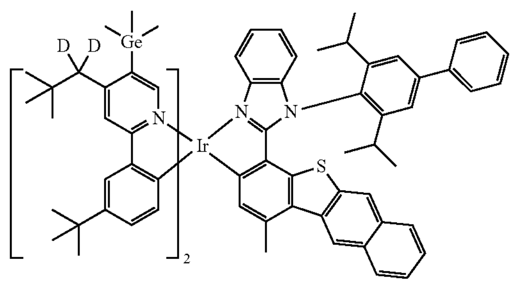
1723
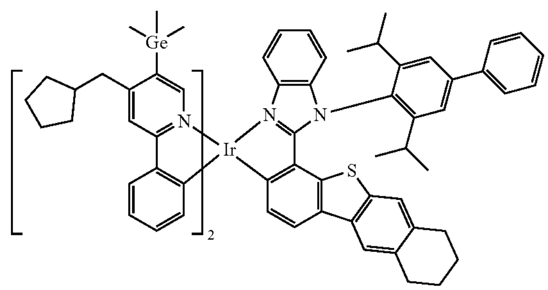
1724
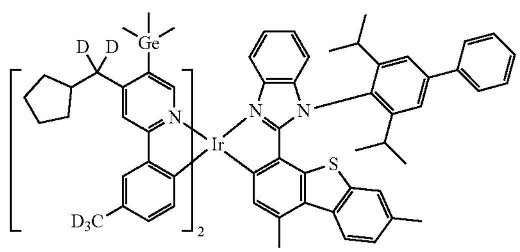
1725
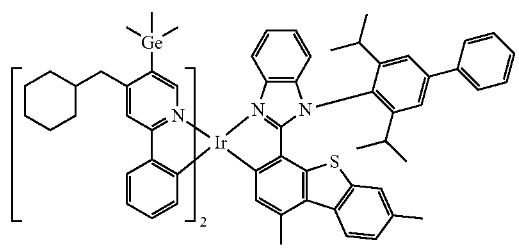
1726
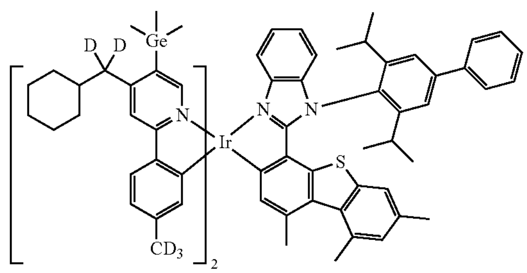
1727
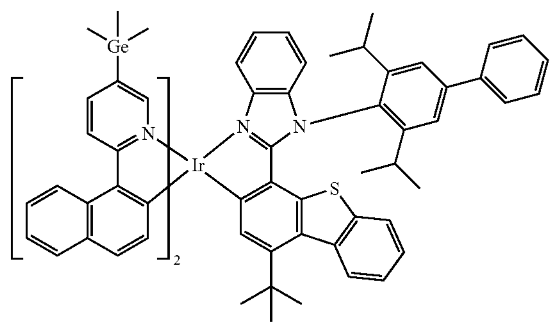
1728
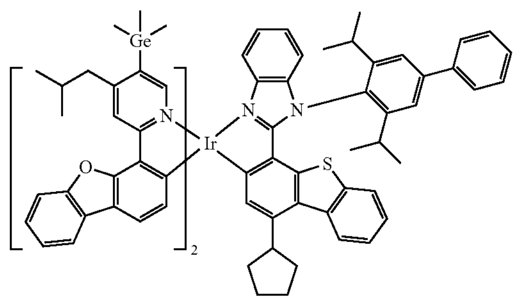
1729
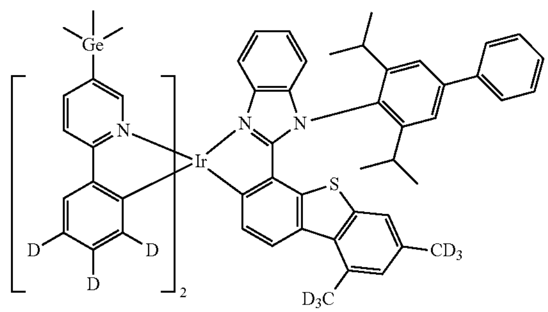

-continued
1730
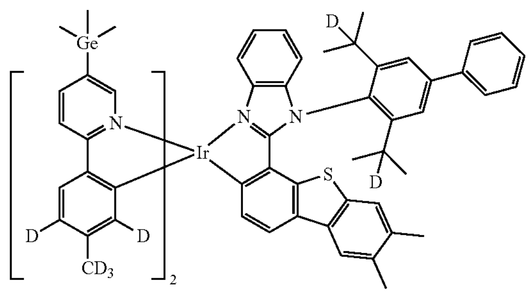
1731
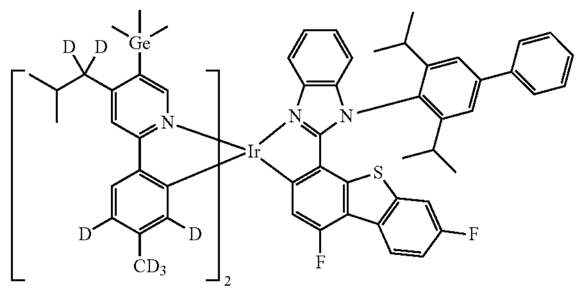
1732
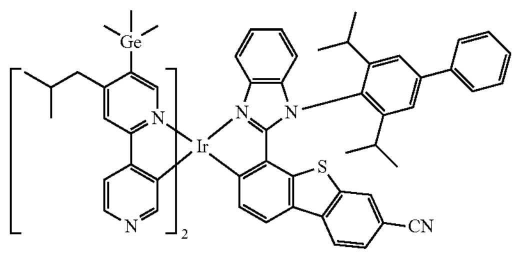
1733
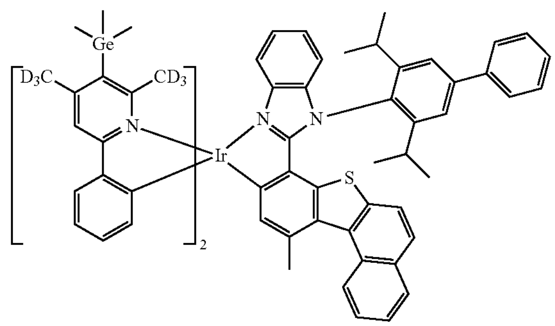
1734
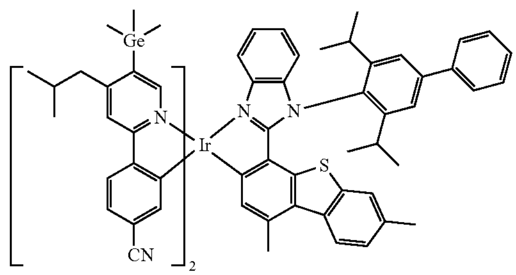
1735
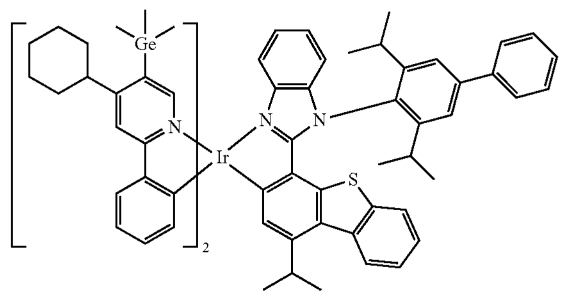
1736
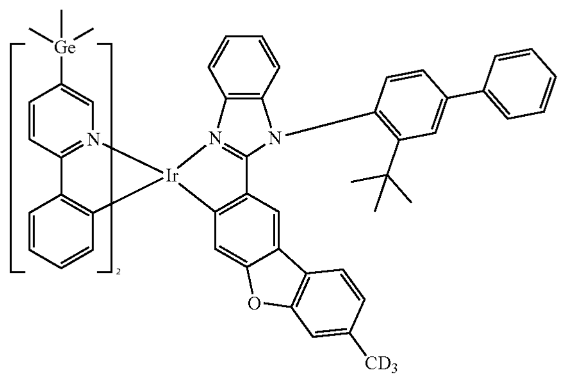
1737
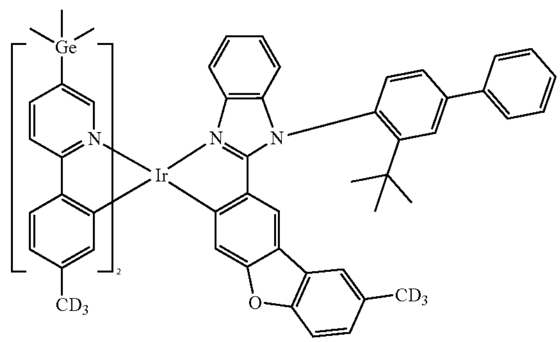

-continued
1738
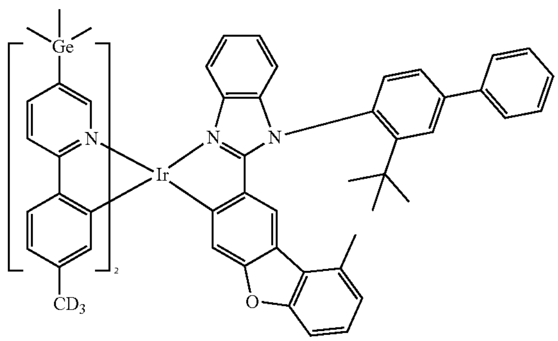
1739
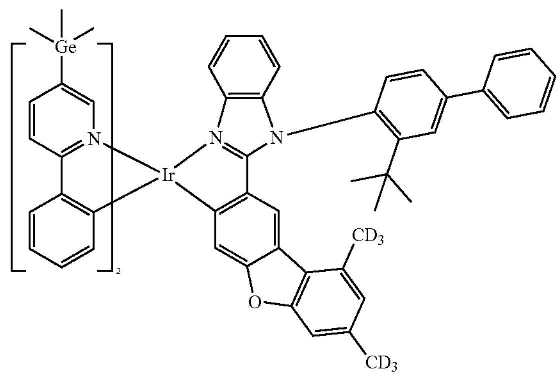
1740
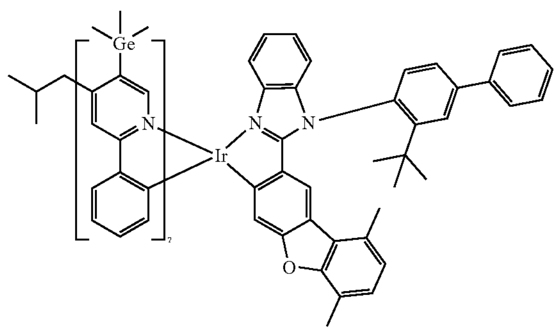
1741
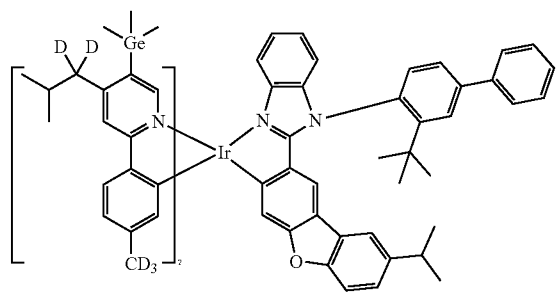
1742
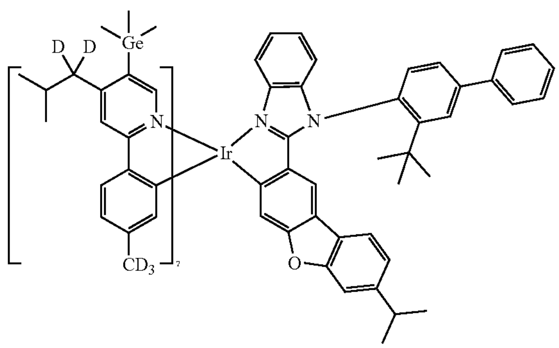
1743
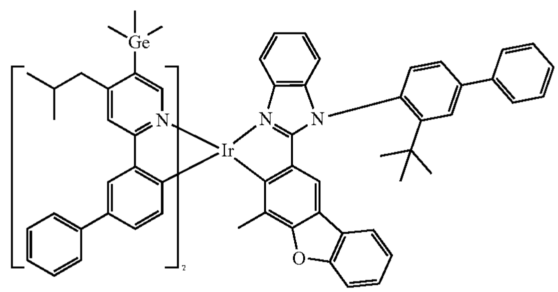
1744
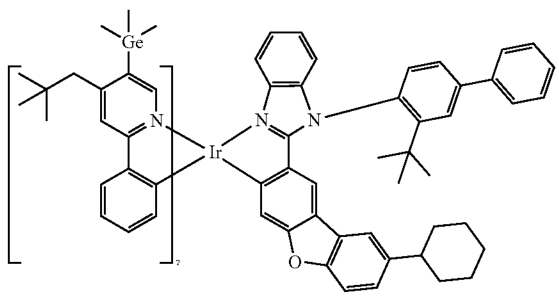
1745
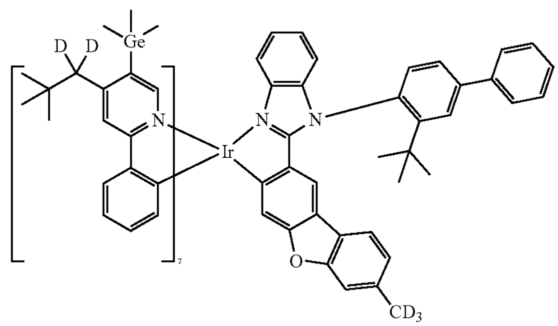

-continued
1746
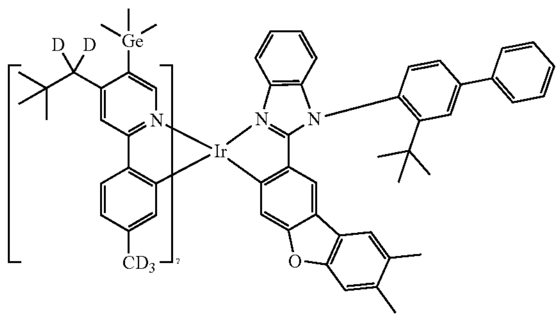
1747
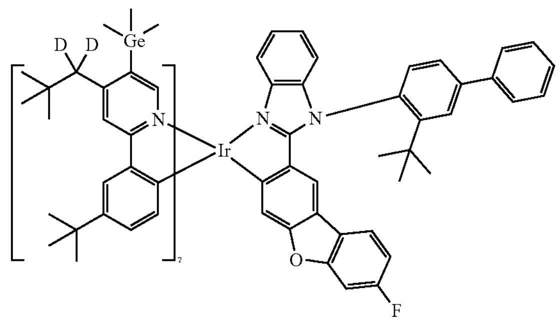
1748
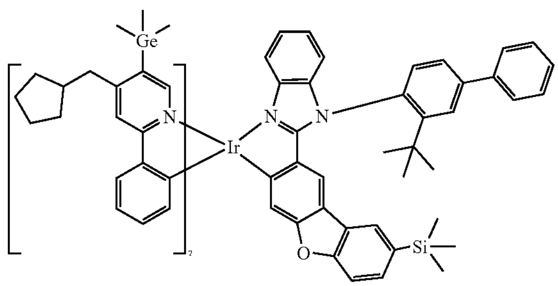
1749
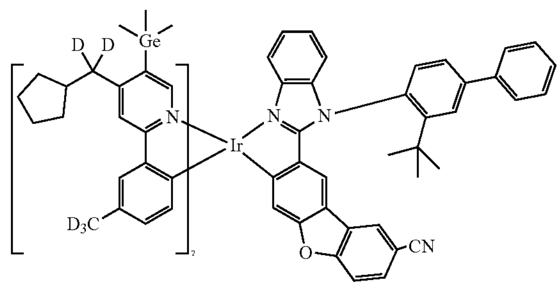
1750
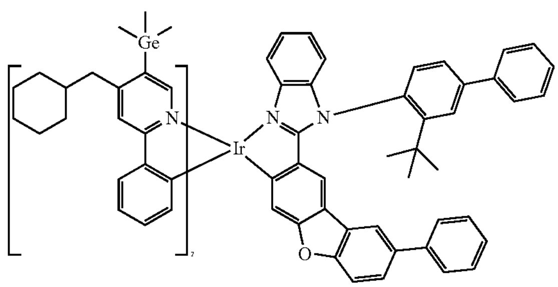
1751
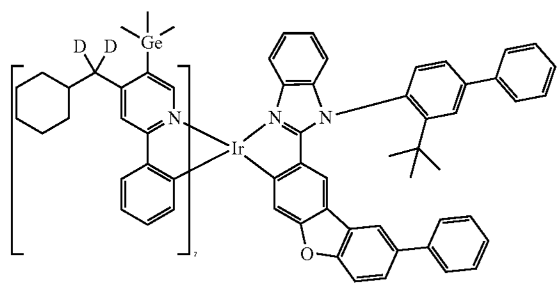
1752
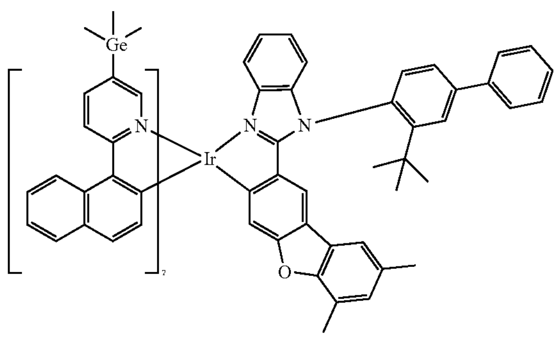
1753
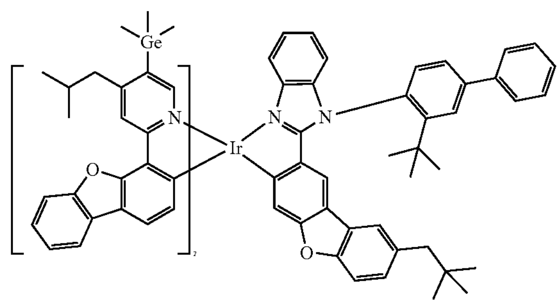
1754
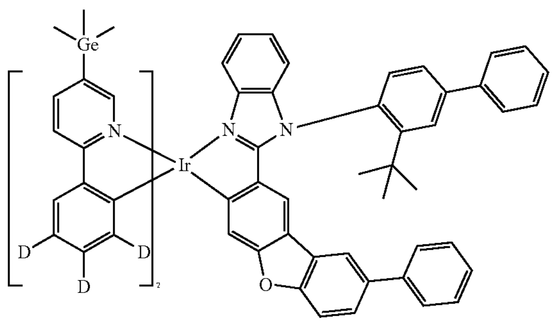
1755
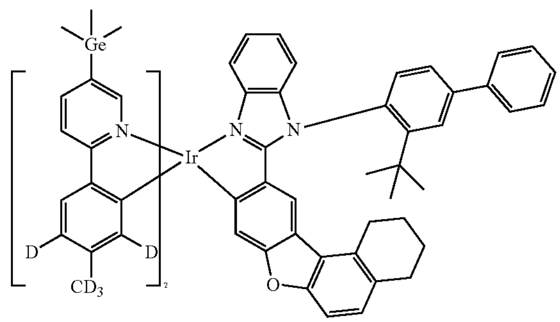

-continued
1756
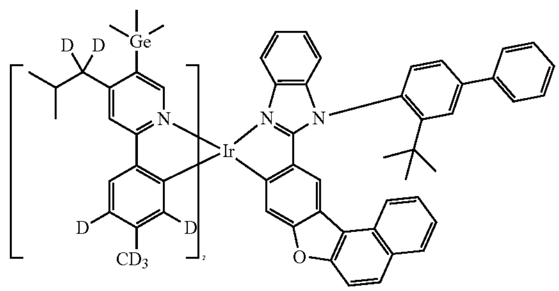
1757
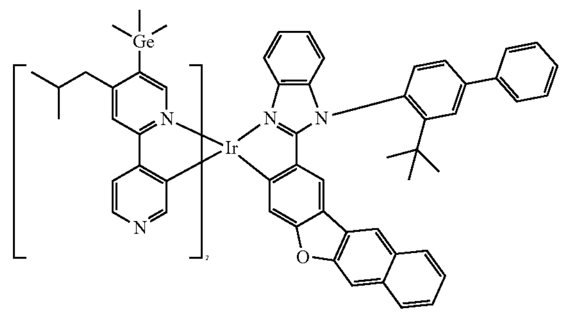
1758
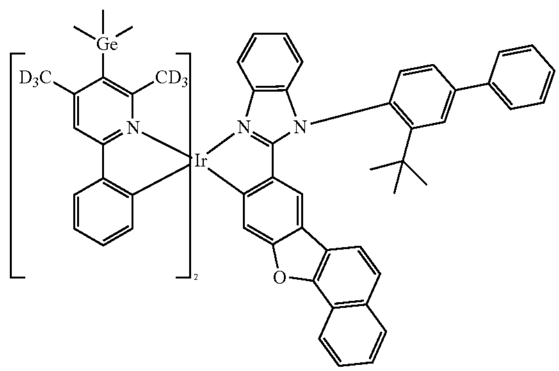
1759
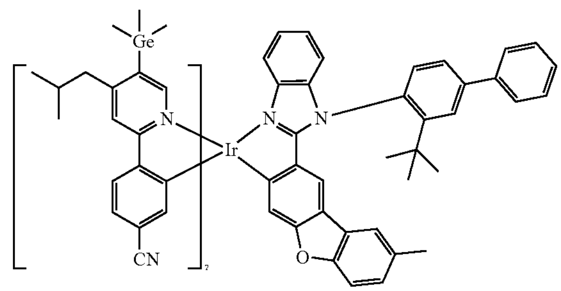
1760
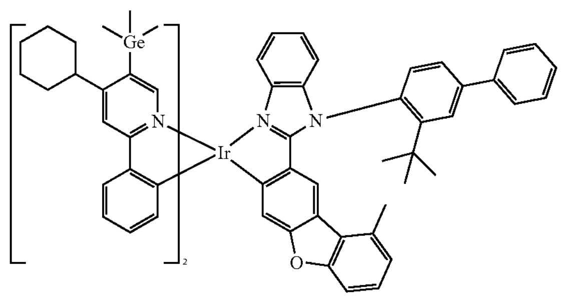
1761
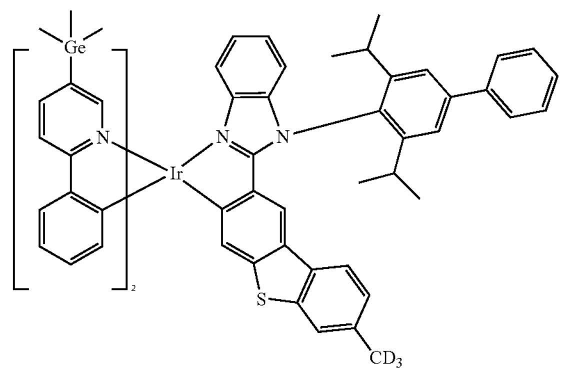
1762
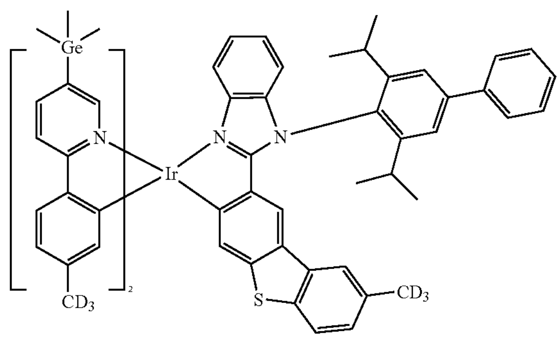
1763
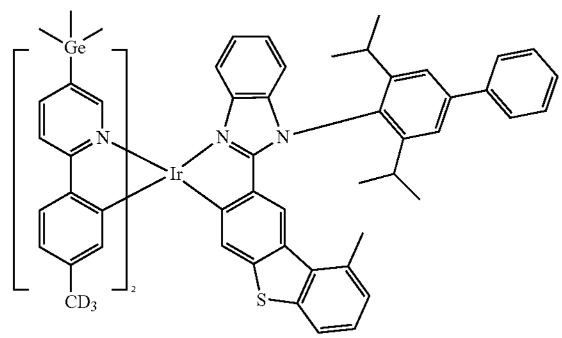

-continued
1764
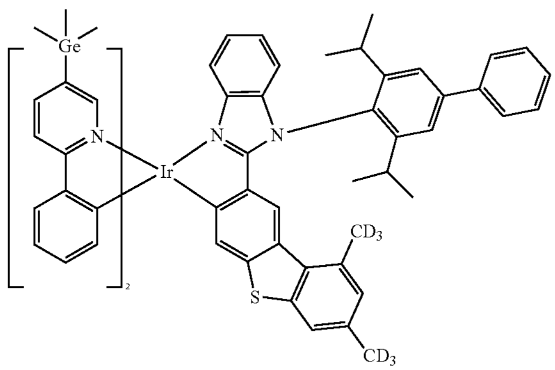
1765
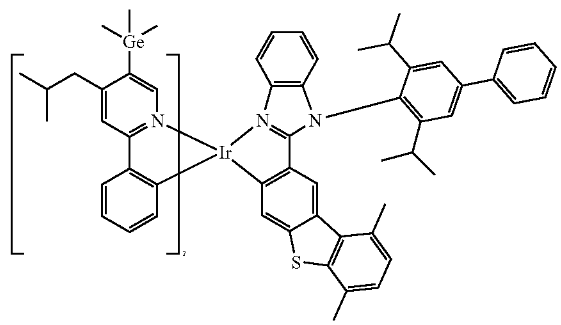
1766
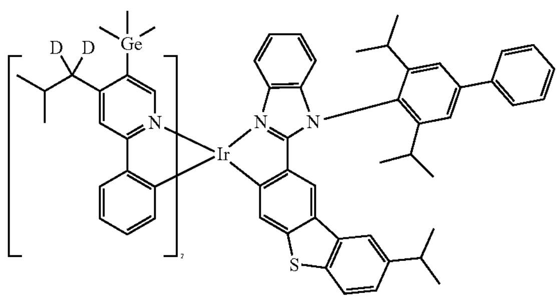
1767
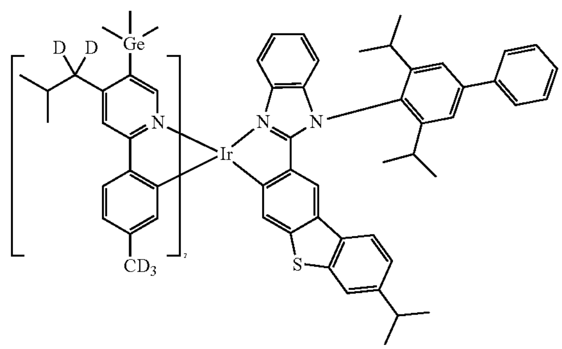
1768
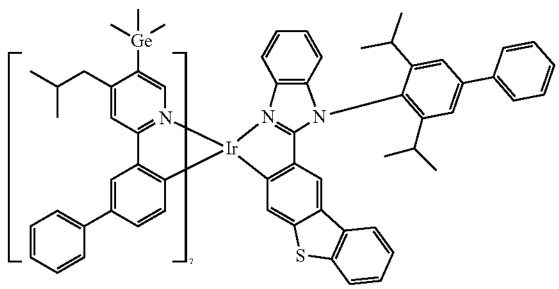
1769
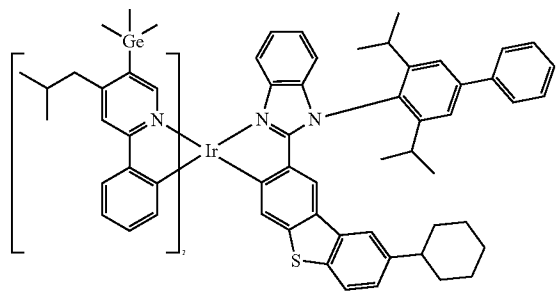
1770
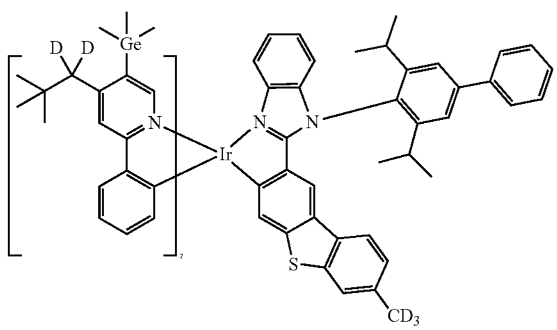
1771
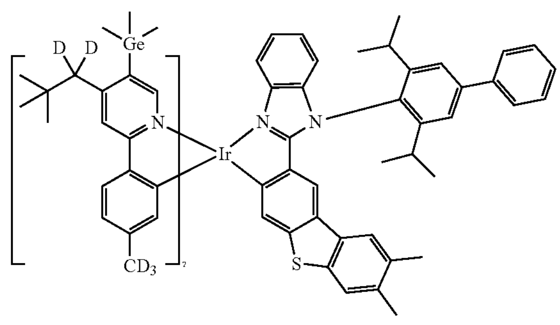

-continued
1772
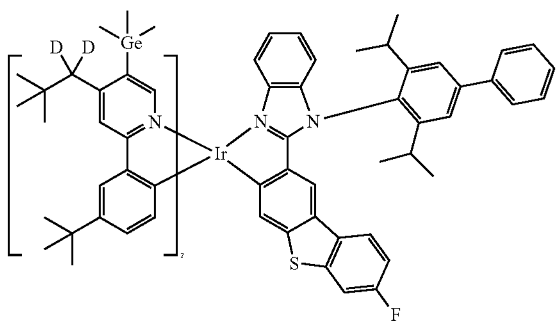
1773
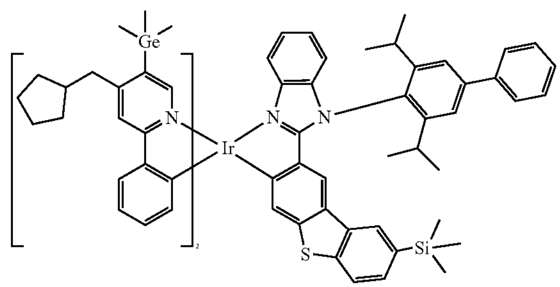
1774
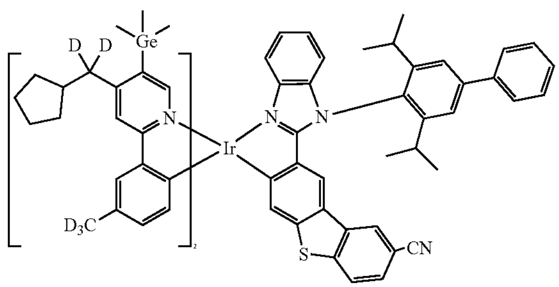
1775
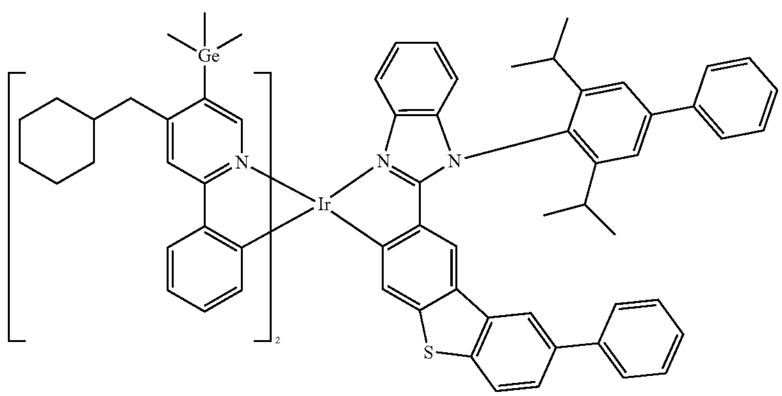
1776
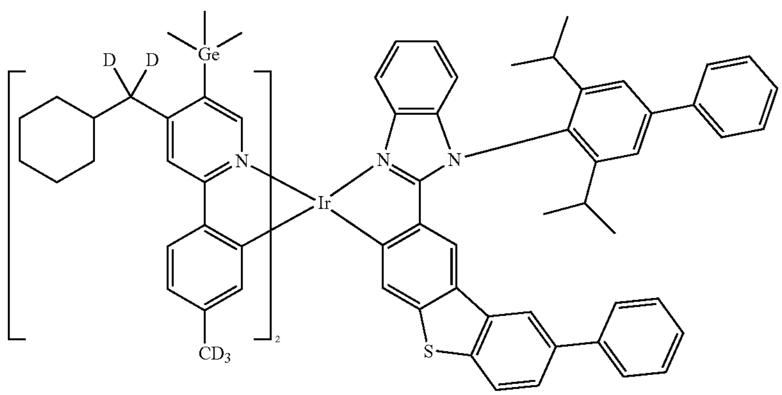

-continued
1777
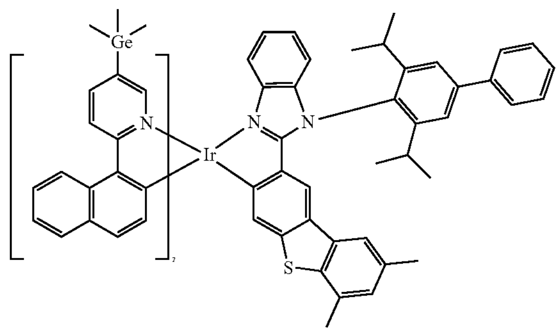
1778
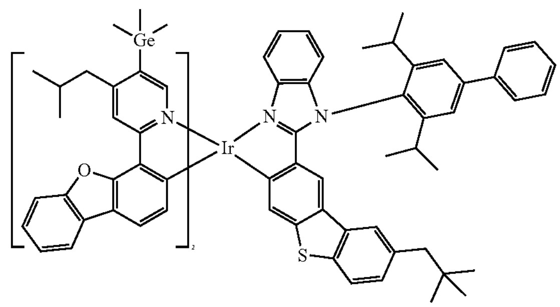
1779
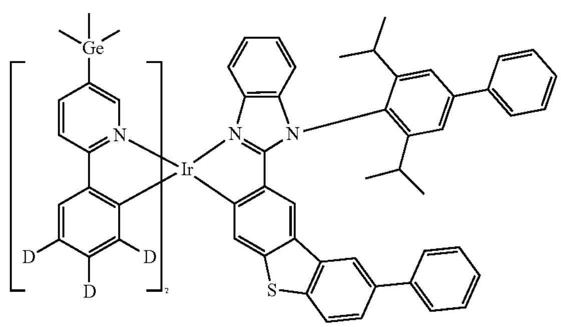
1780
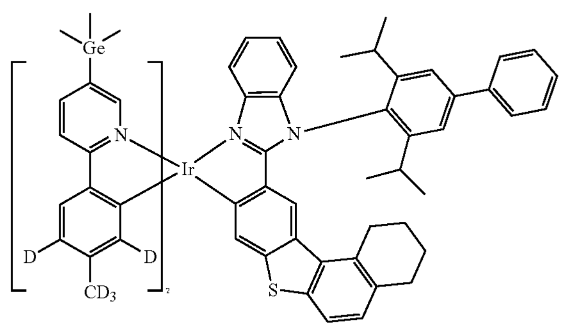
1781
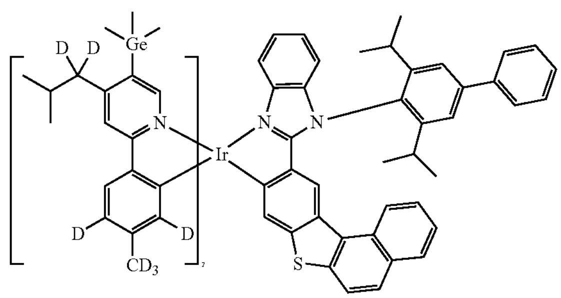
1782
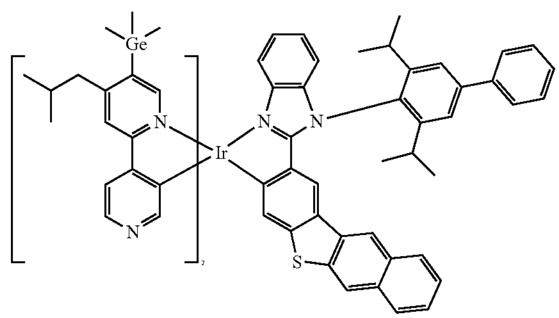
1783
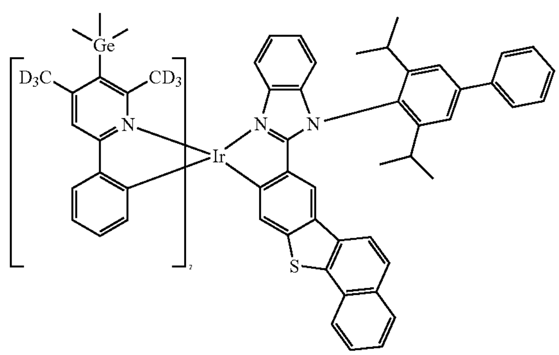
1784
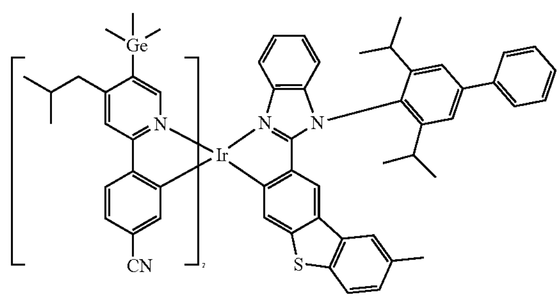

-continued
1785
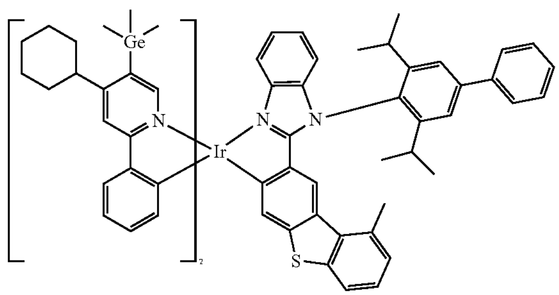
1786
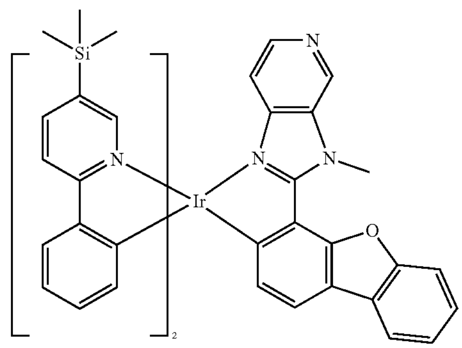
1787
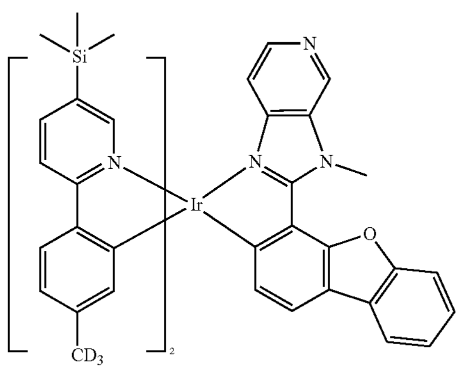
1788
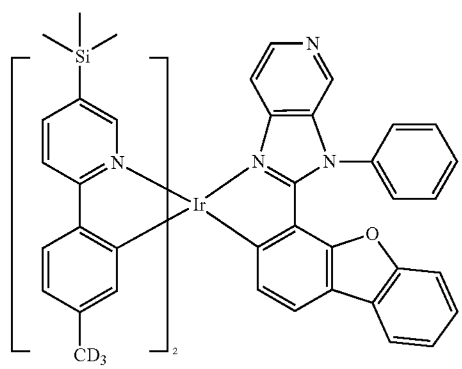
1789
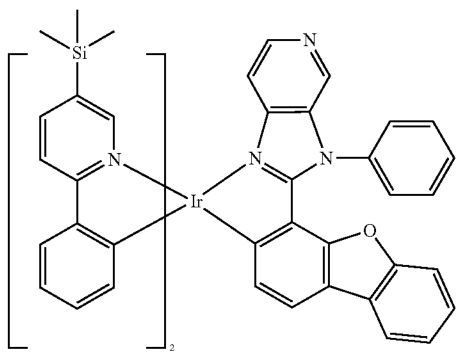
1790
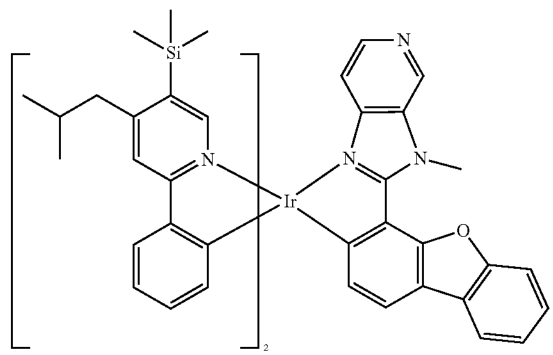
1791
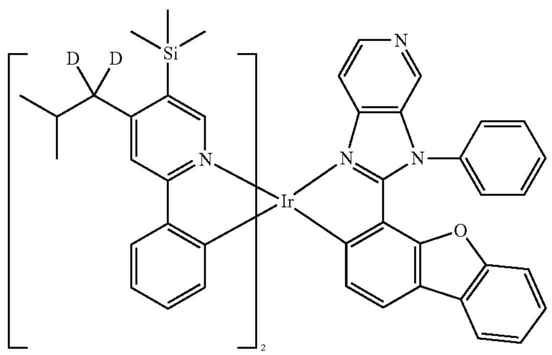
1792
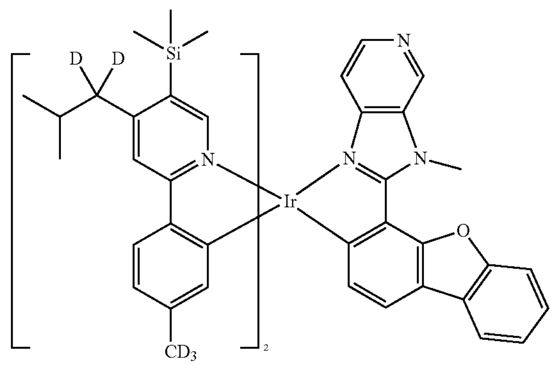

-continued
1793
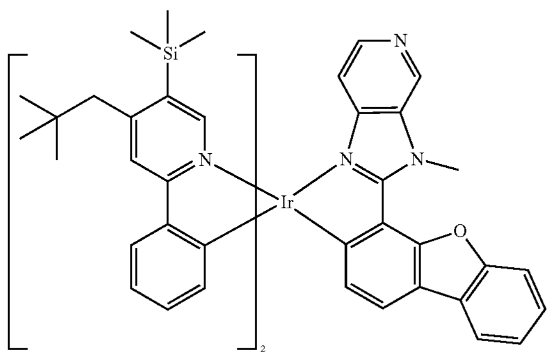
1794
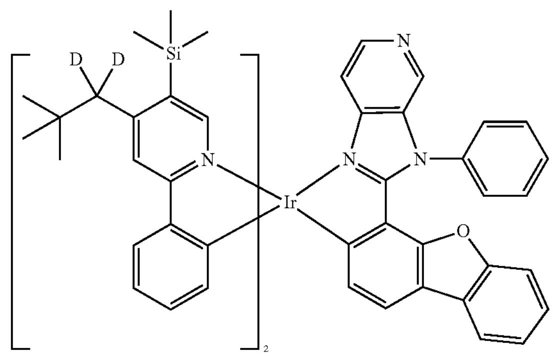
1795
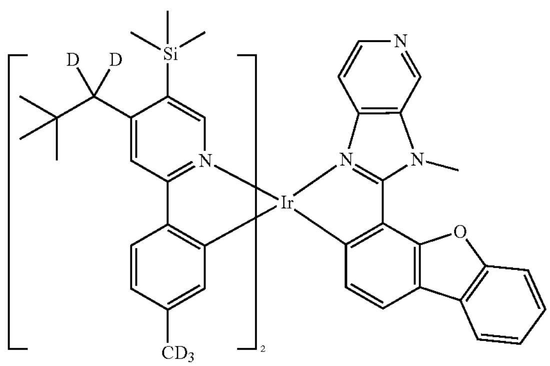
1796
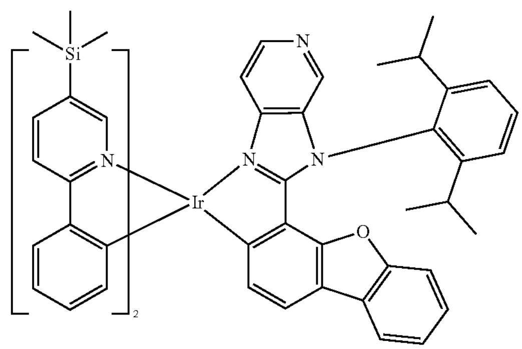
1797
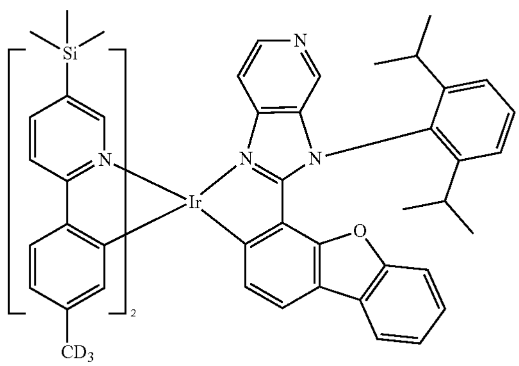
1798
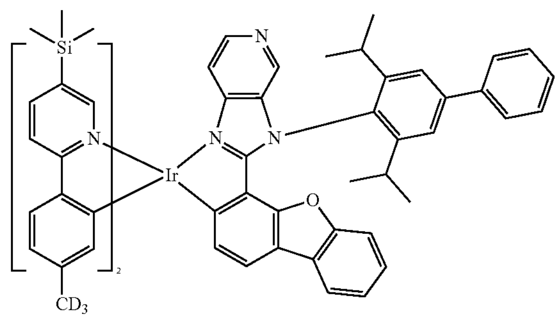
1799
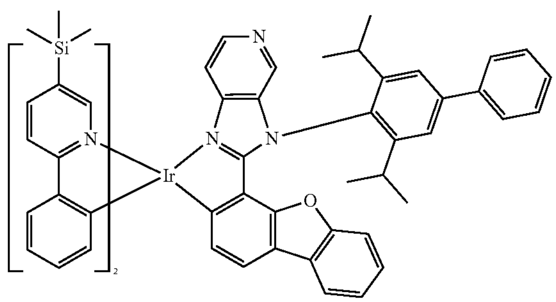
1800
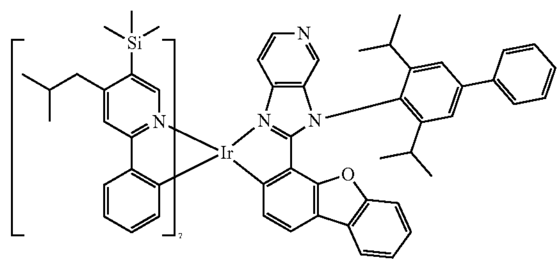

-continued
1801
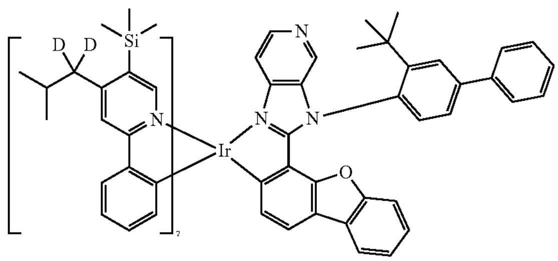
1802
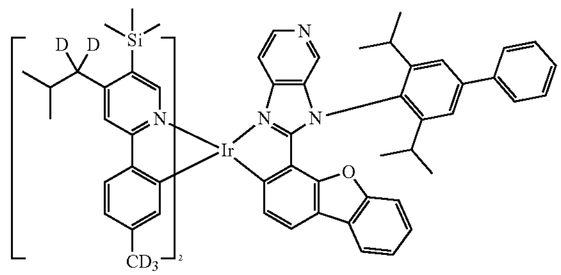
1803
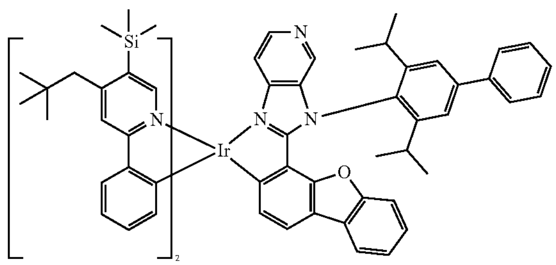
1804
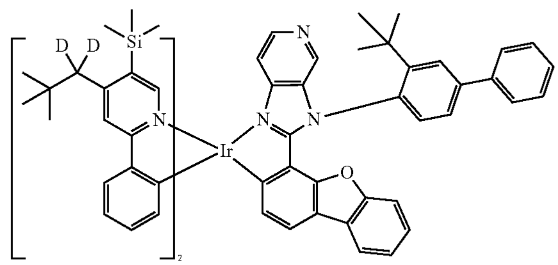
1805
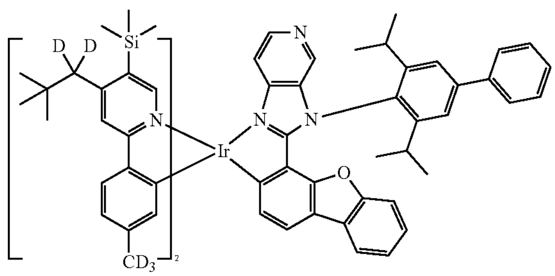
1806
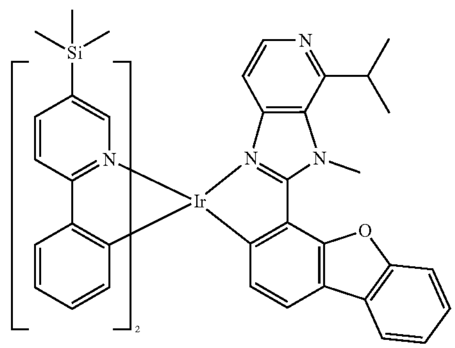
1807
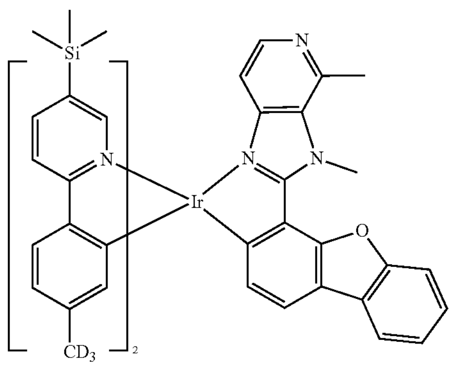
1808
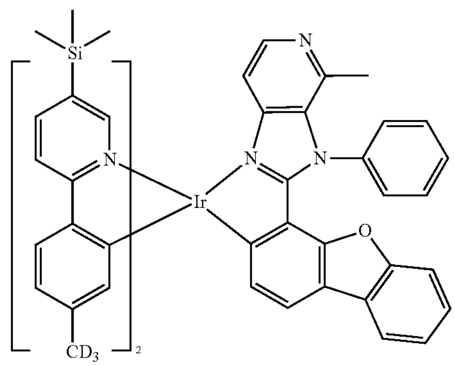

-continued
1809
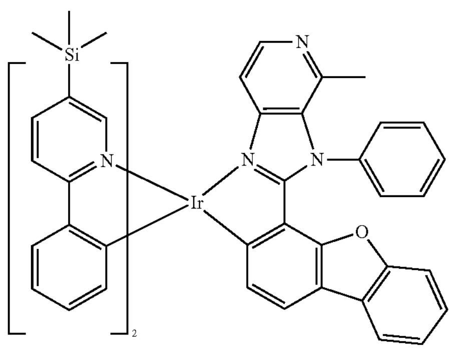
1810
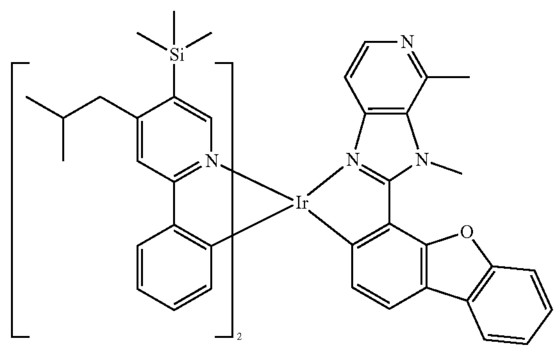
1811
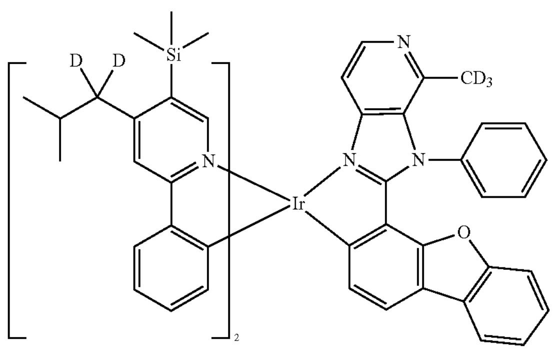
1812
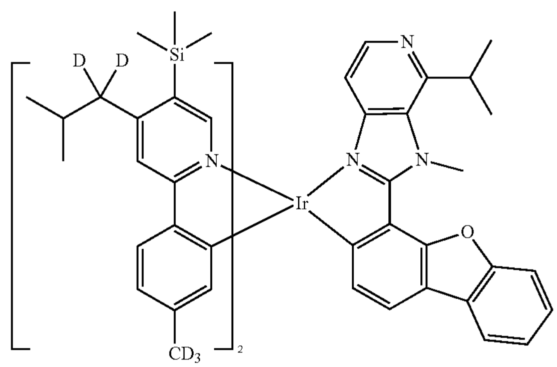
1813
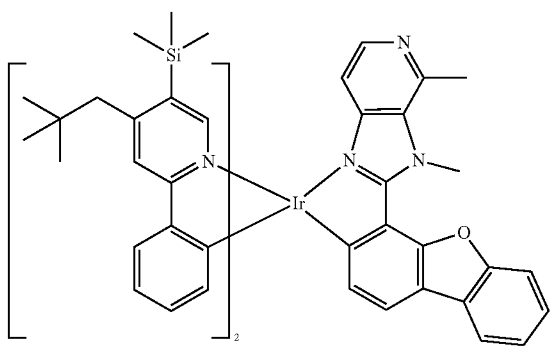
1814
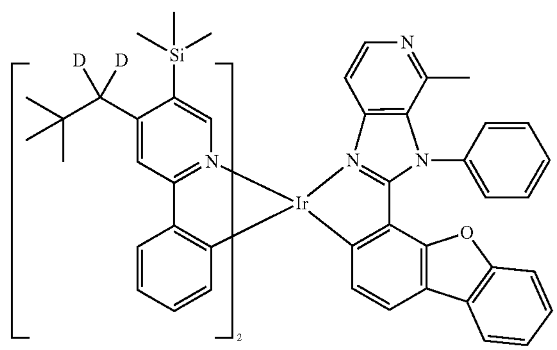
1815
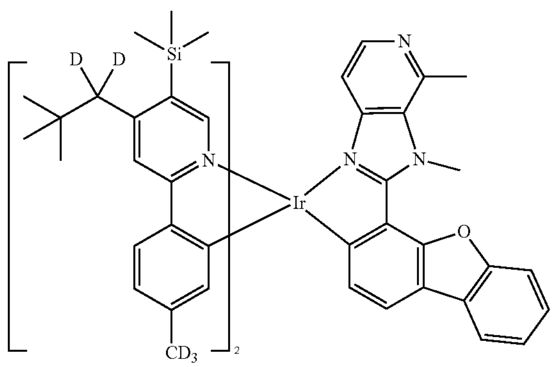
1816
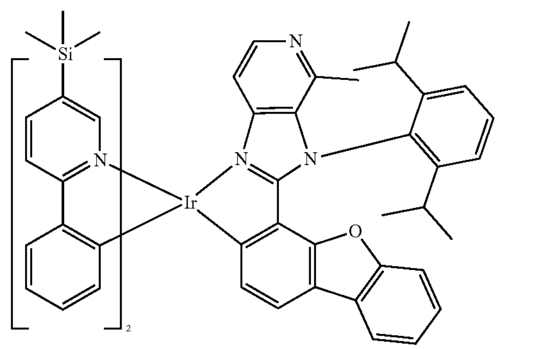

-continued
1817
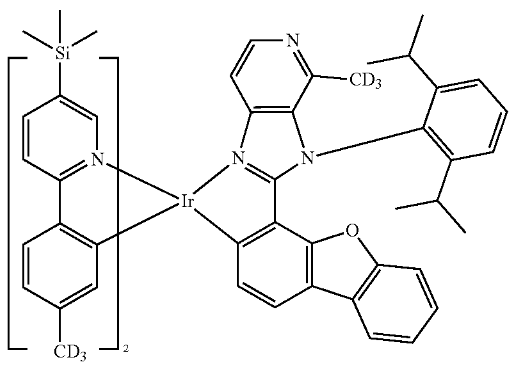
1818
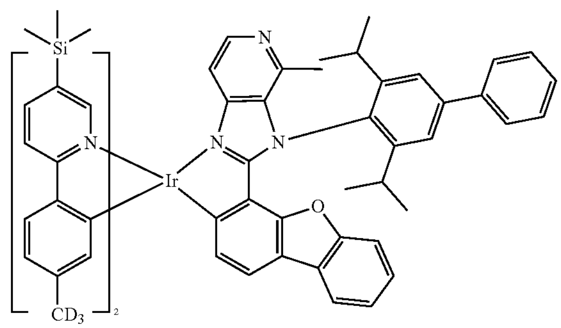
1819
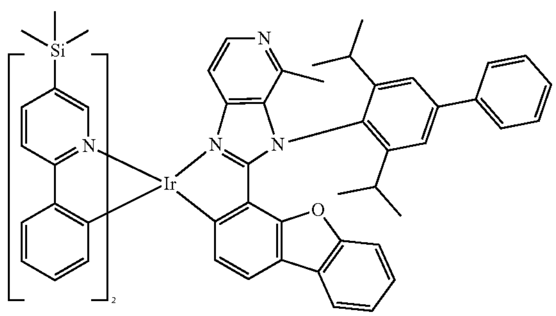
1820
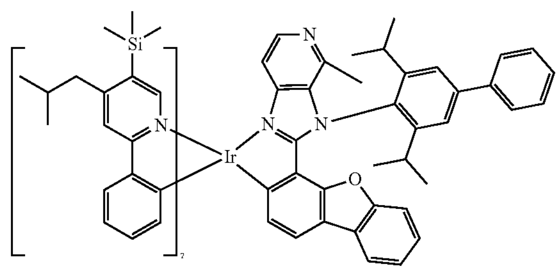
1821
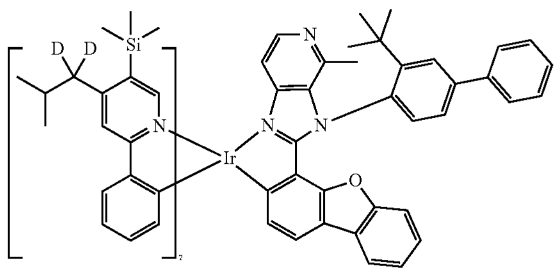
1822
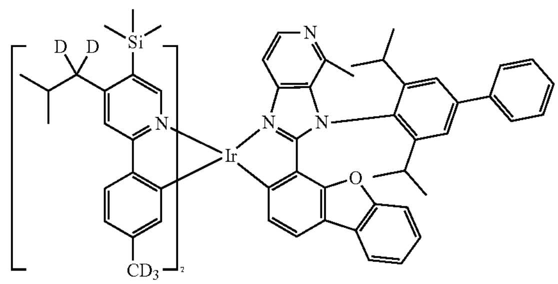
1823
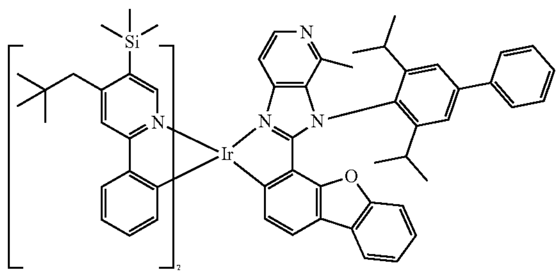
1824
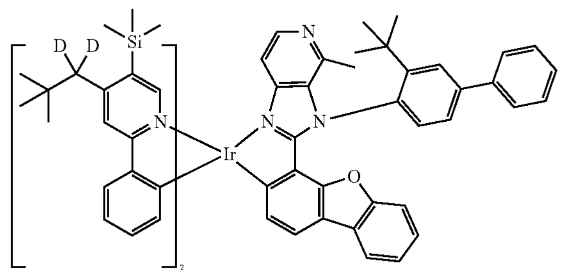

-continued
1825
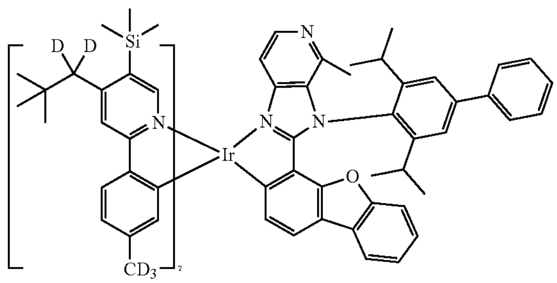
1826
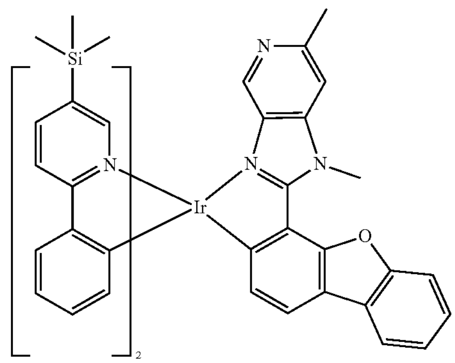
1827
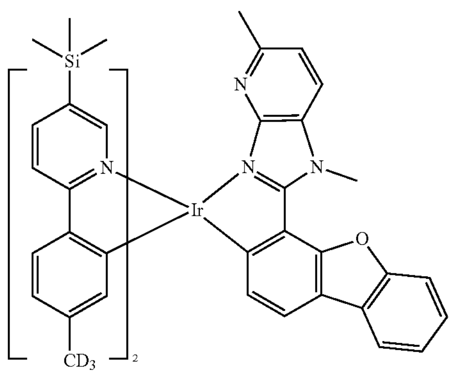
1828
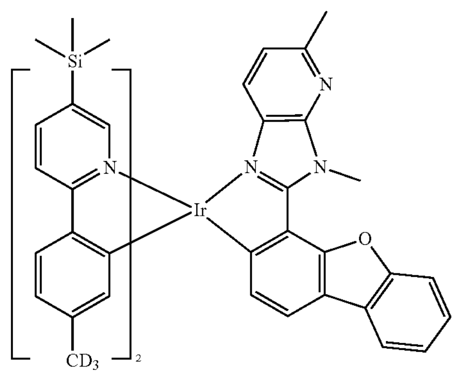
1829
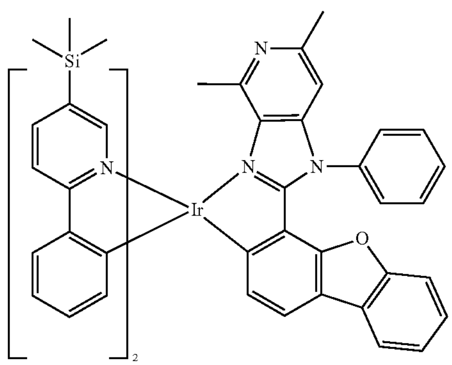
1830
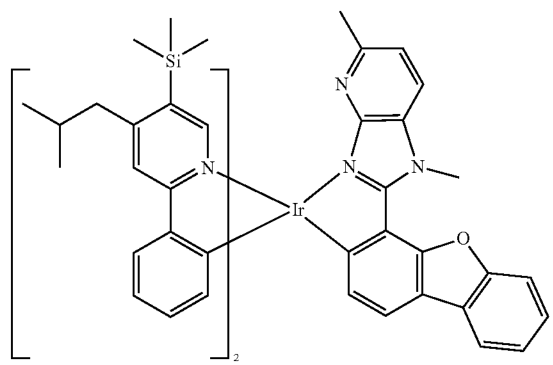
1831
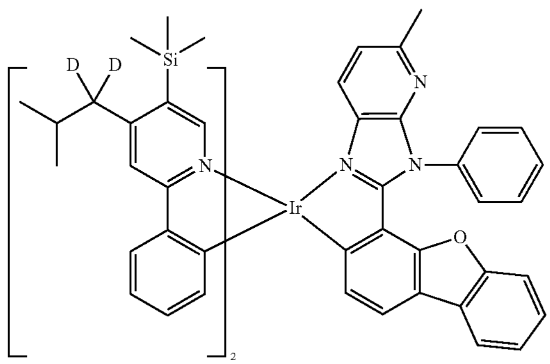
1832
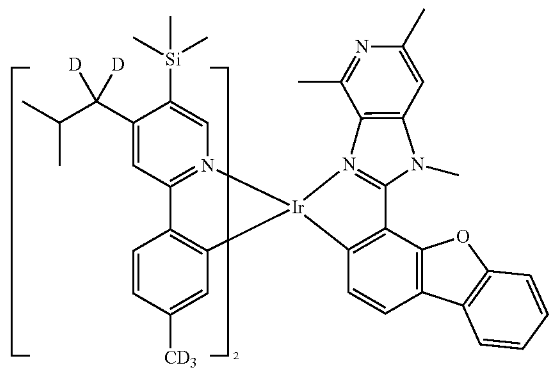

-continued
1833
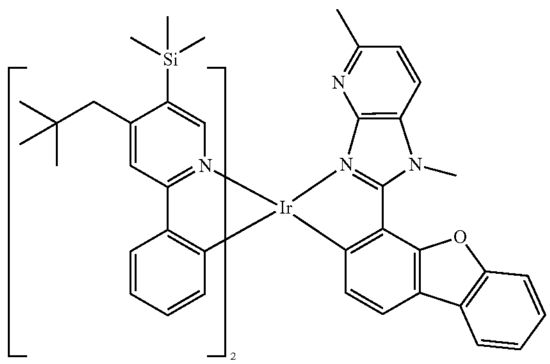
1834
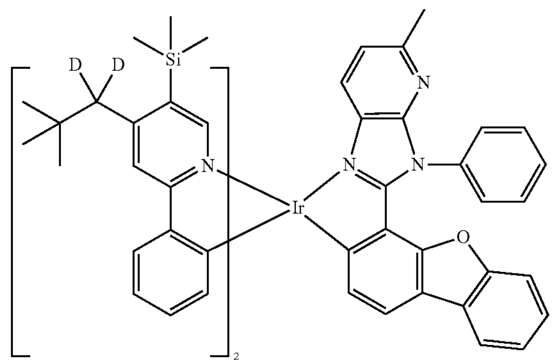
1835
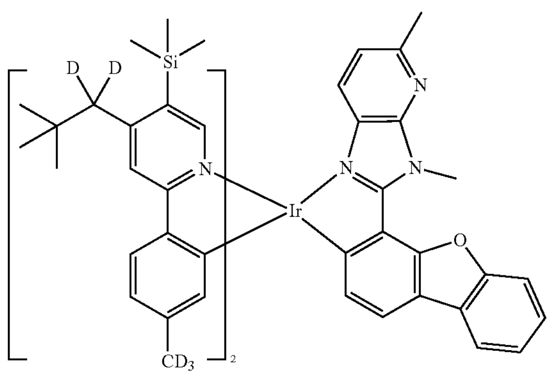
1836
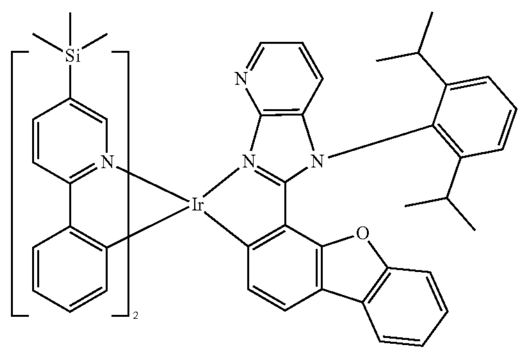
1837
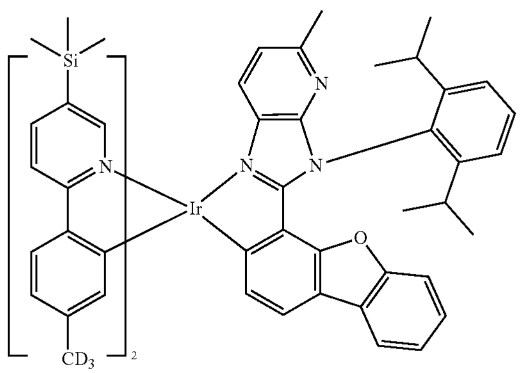
1838
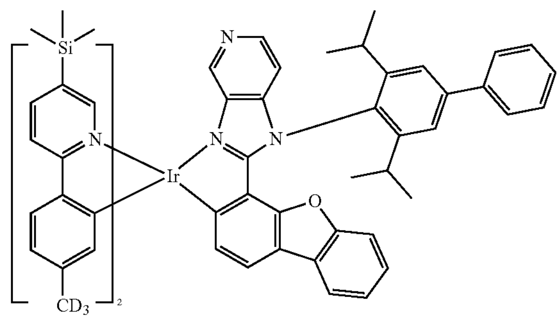
1839
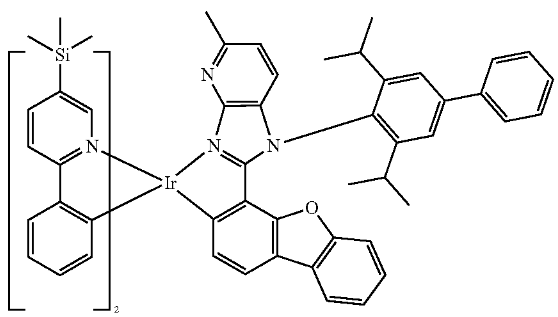
1840
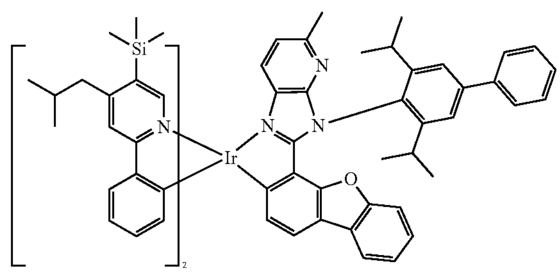

-continued
1841
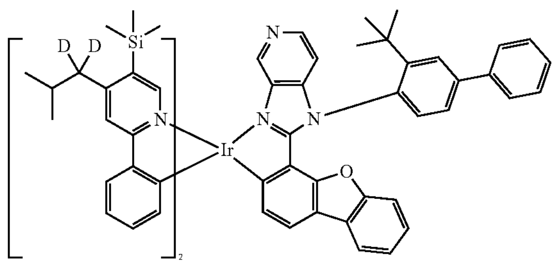
1842
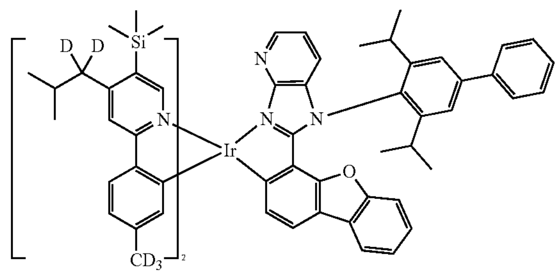
1843
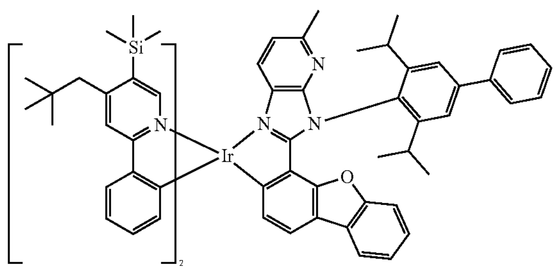
1844
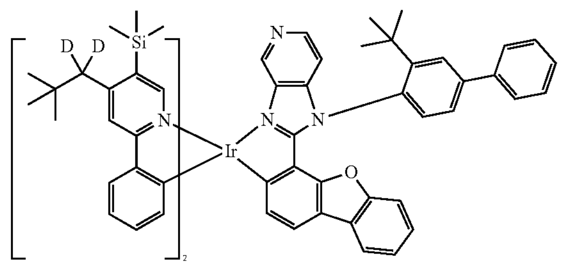
1845
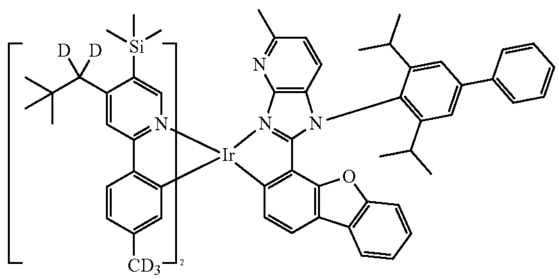
1846
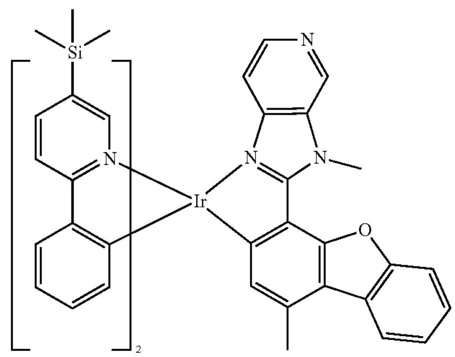
1847
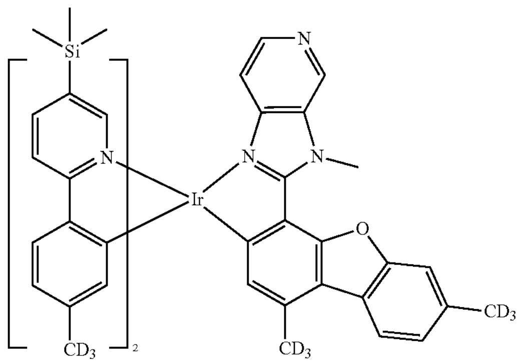
1848
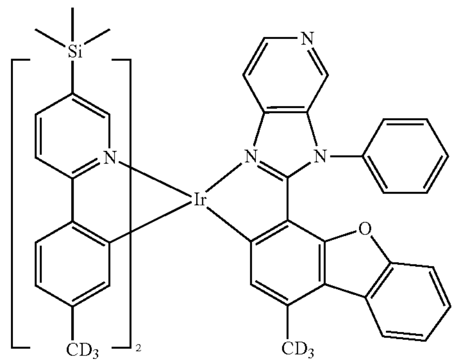

-continued
1849
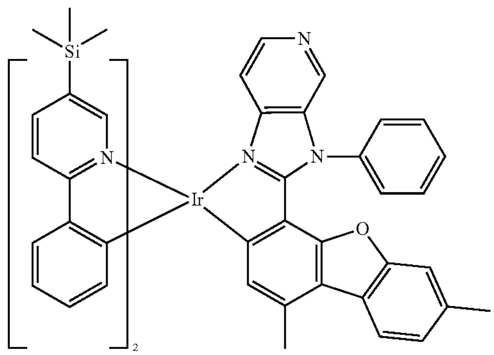
1850
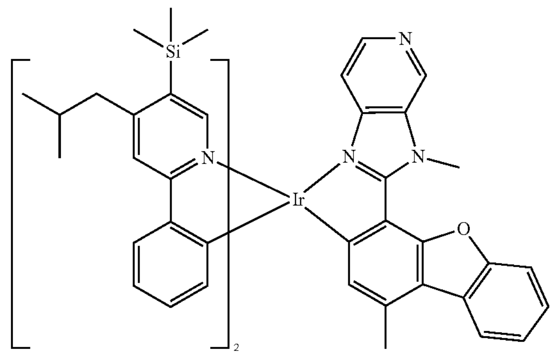
1851
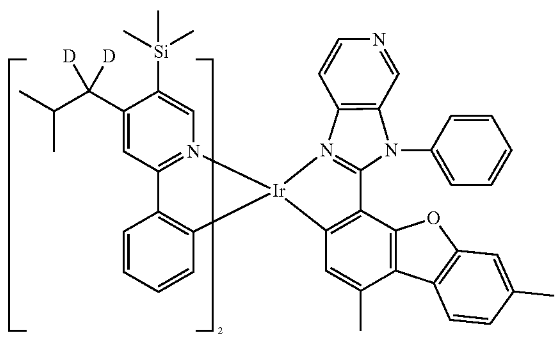
1852
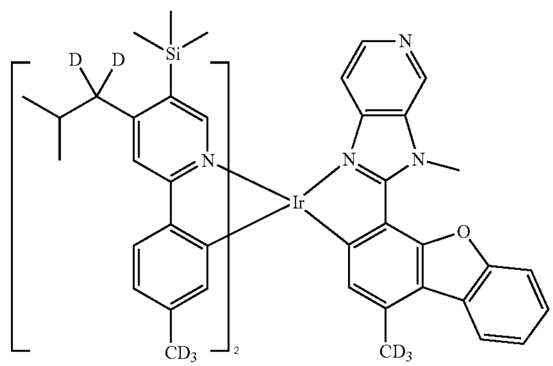
1853
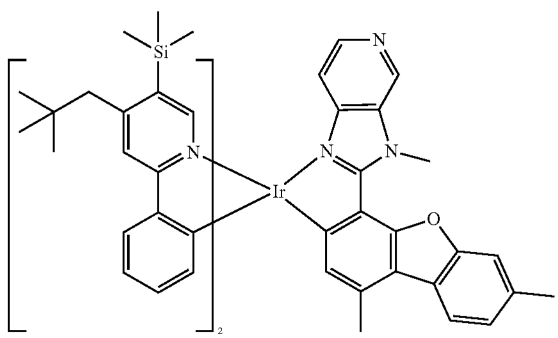
1854
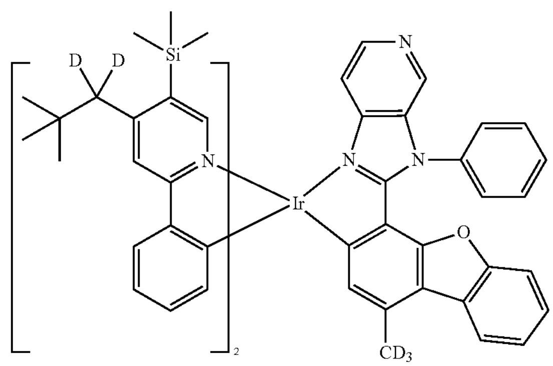
1855
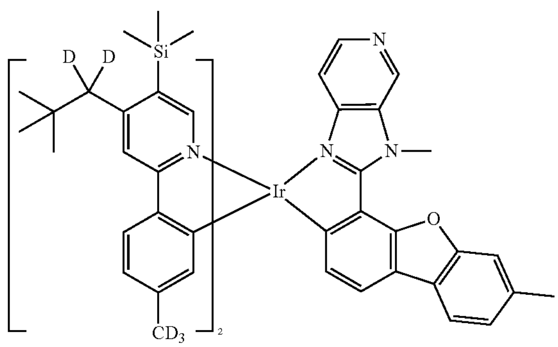
1856
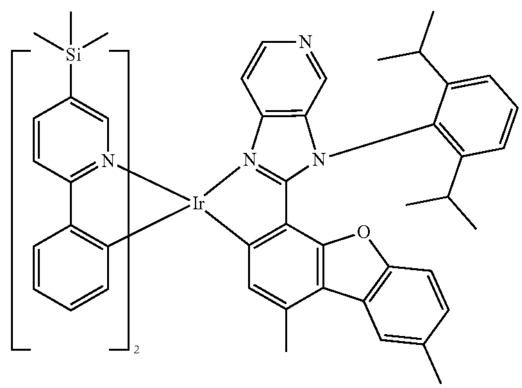

-continued
1857
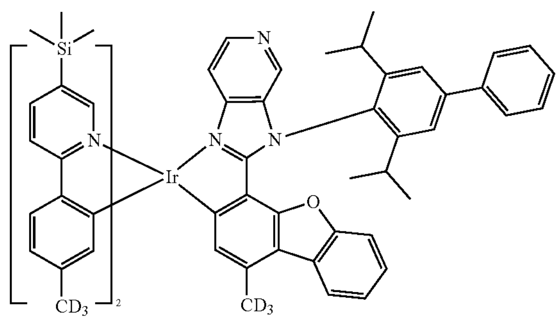
1858
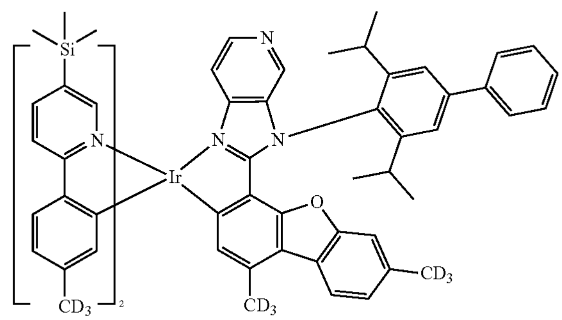
1859
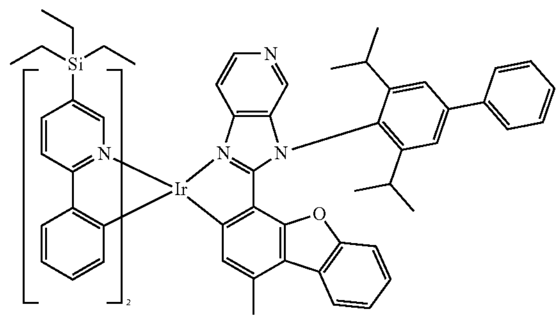
1860
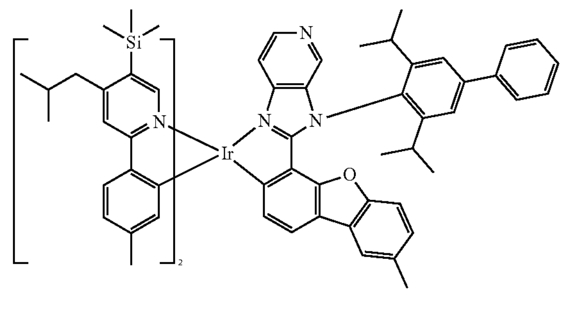
1861
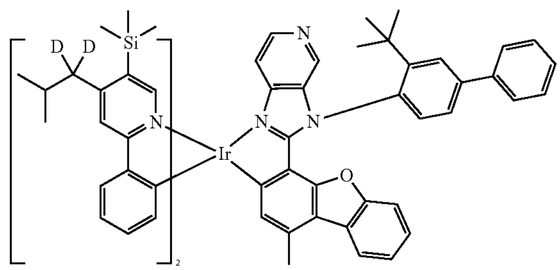
1862
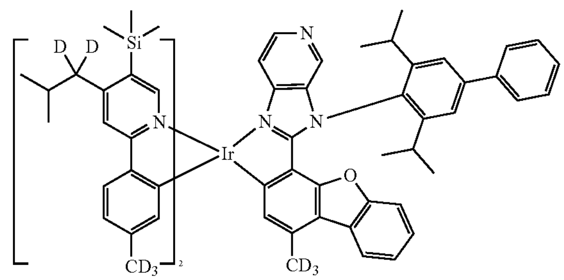
1863
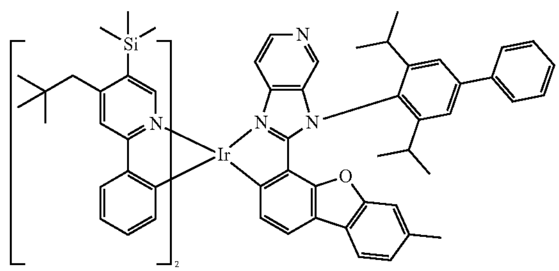
1864
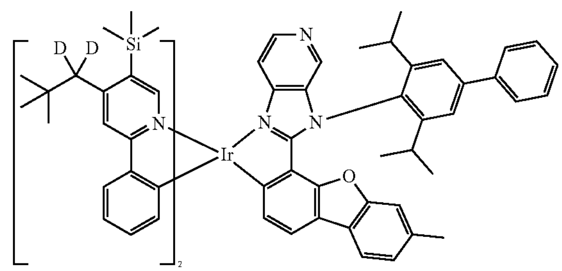
1865
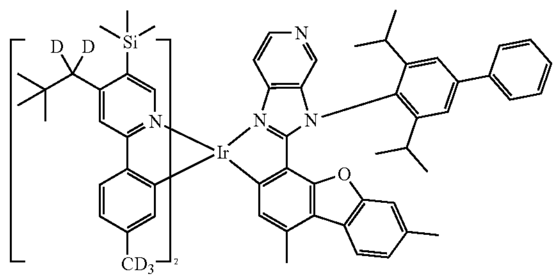
1866
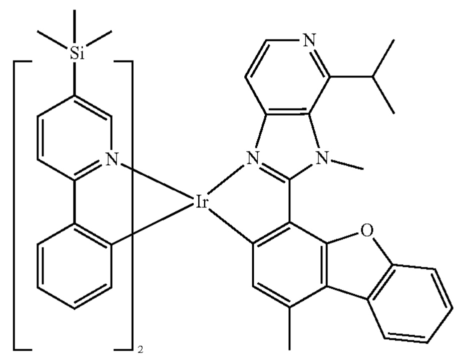

-continued
1867
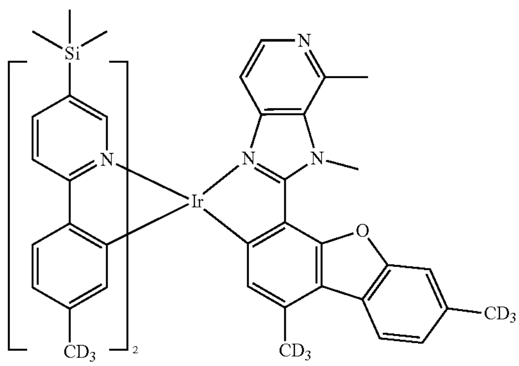
1868
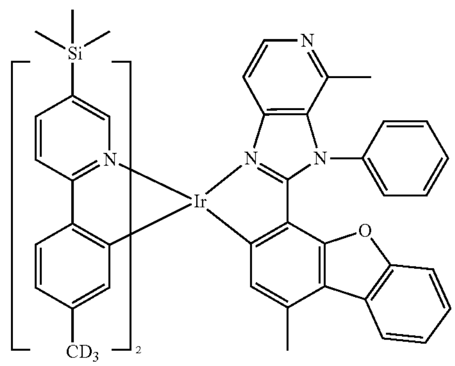
1869
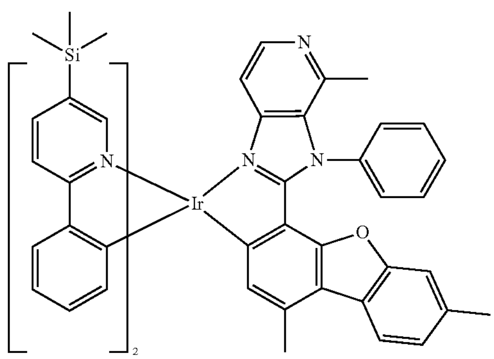
1870
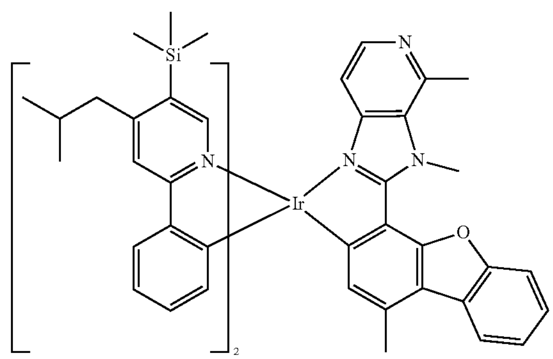
1871
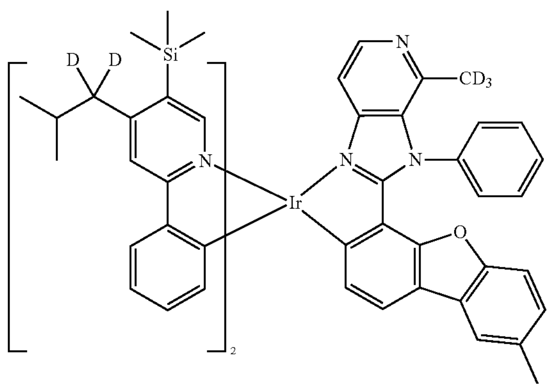
1872
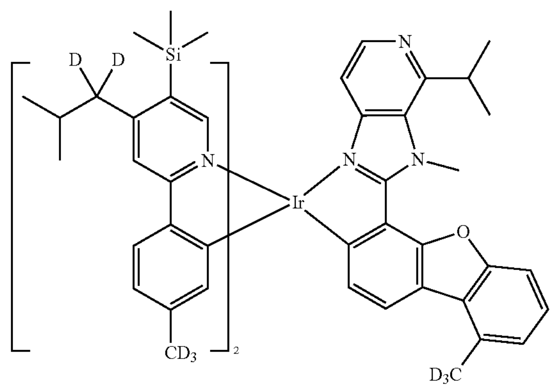
1873
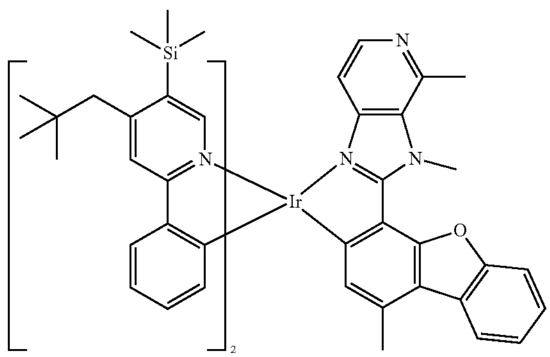
1874
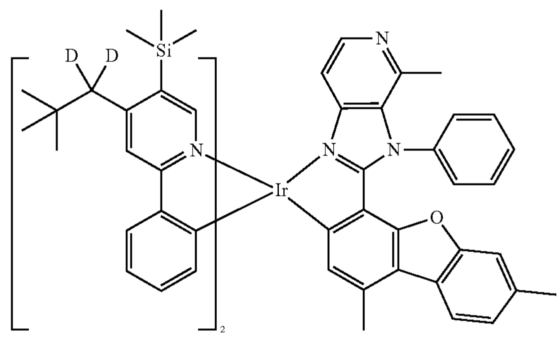

-continued
1875
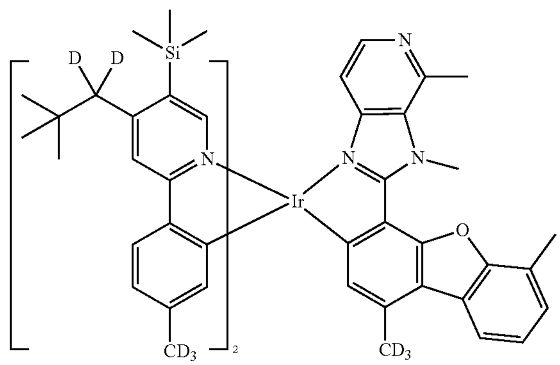
1876
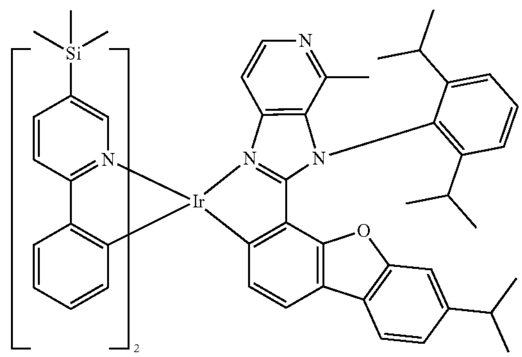
1877
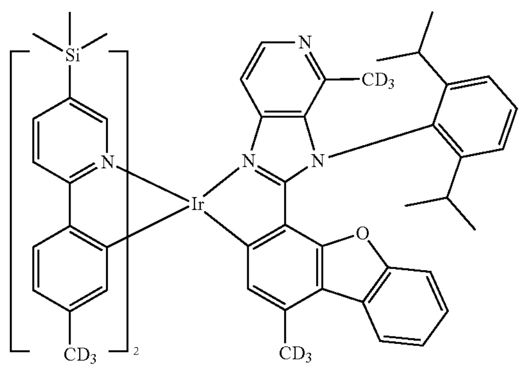
1878
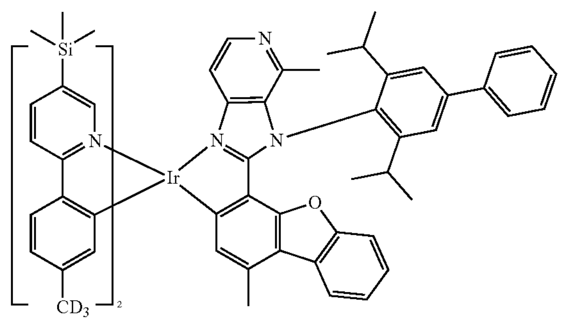
1879
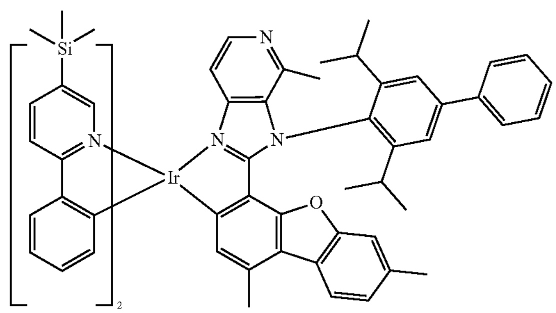
1880
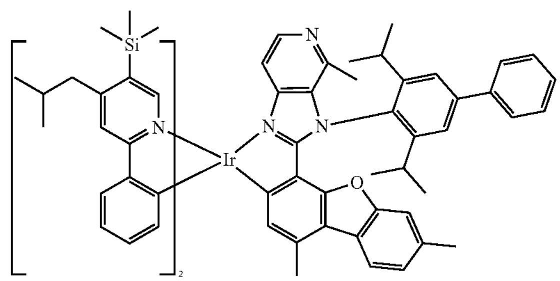
1881
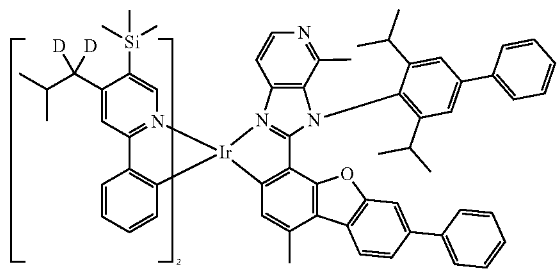
1882
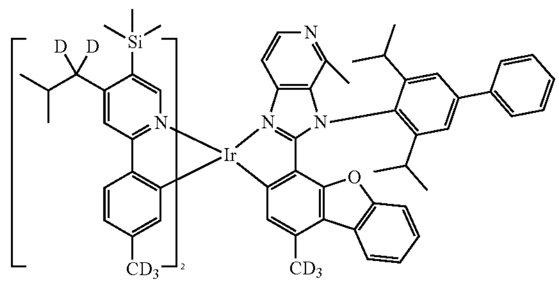

-continued
1883
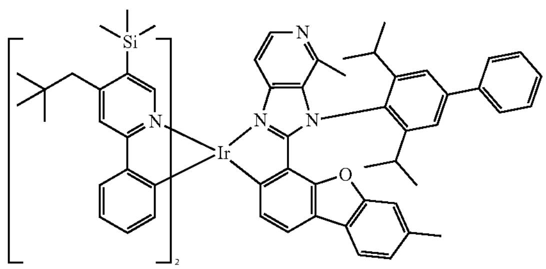
1884
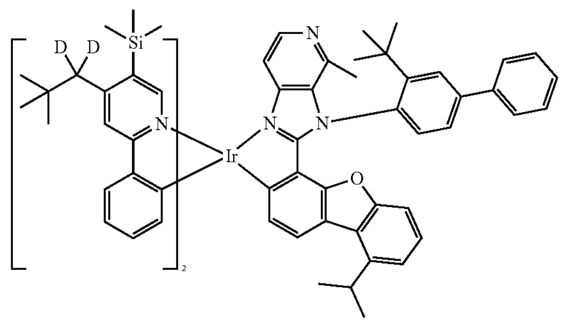
1885
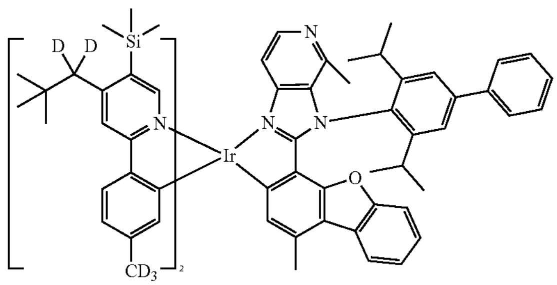
1886
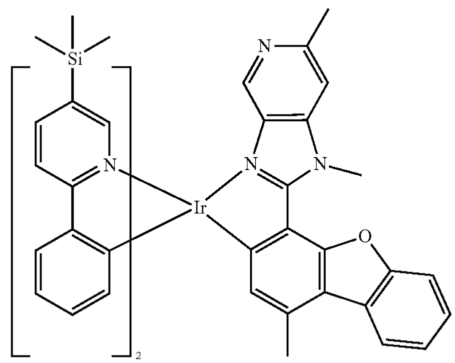
1887
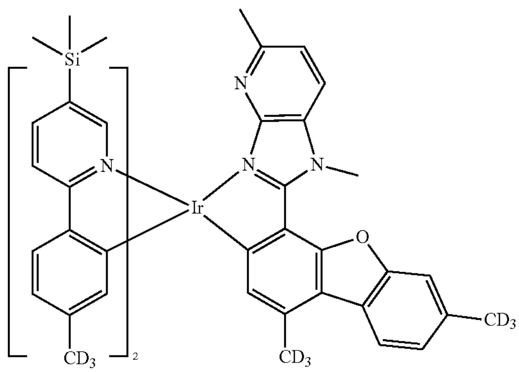
1888
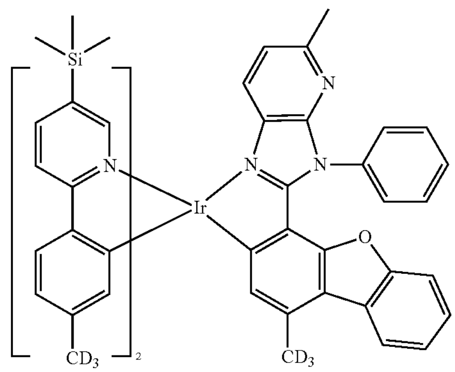
1889
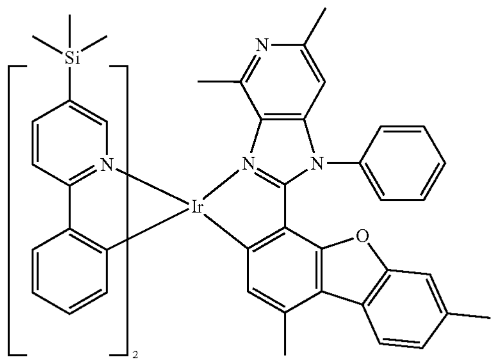
1890
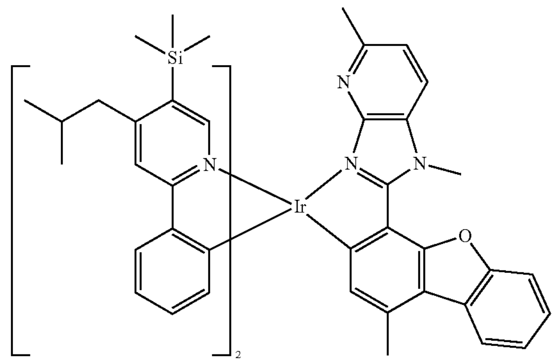

-continued
1891
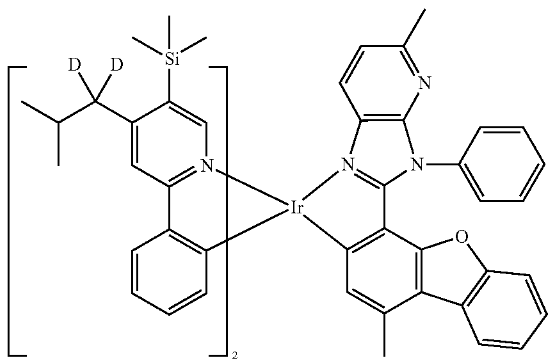
1892
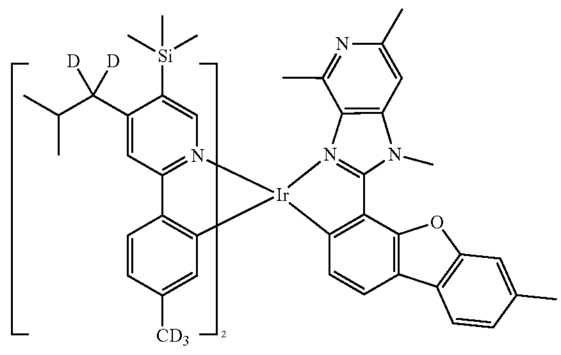
1893
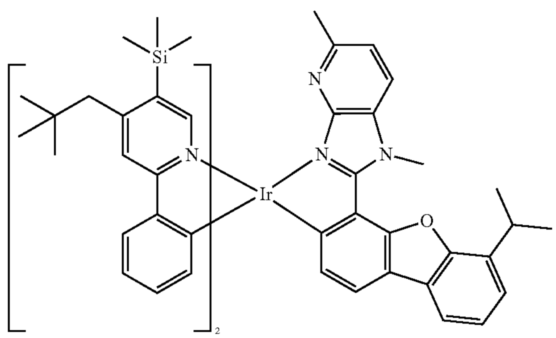
1894
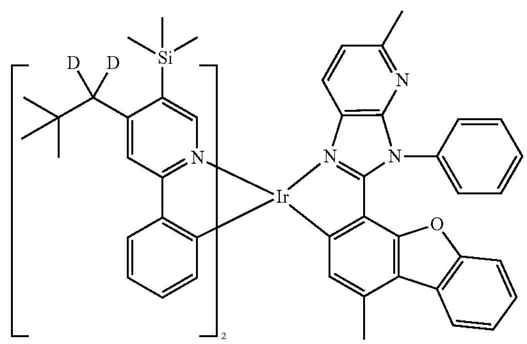
1895
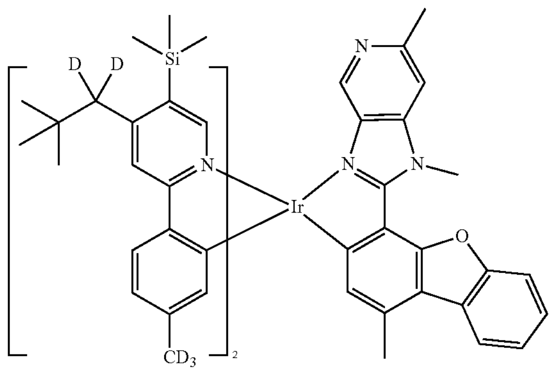
1896
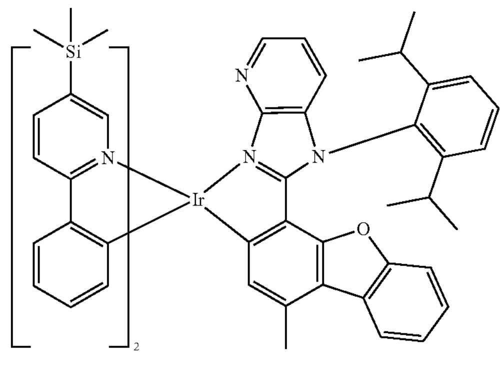
1897
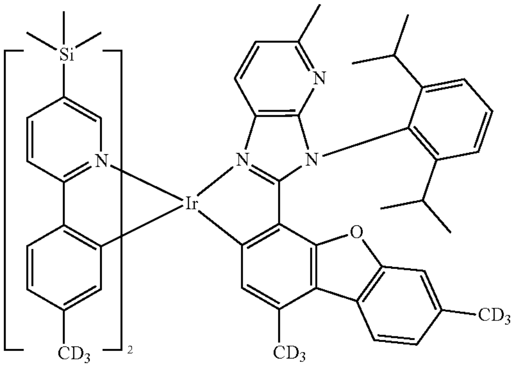
1898
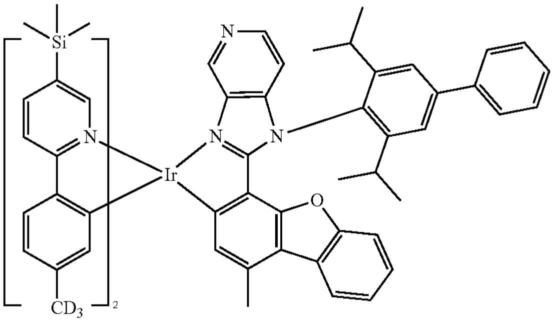

-continued
1899
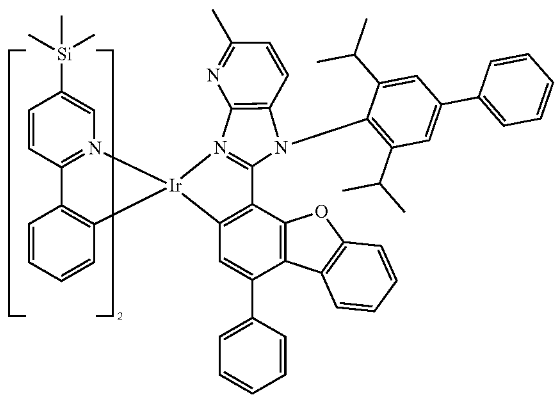
1900
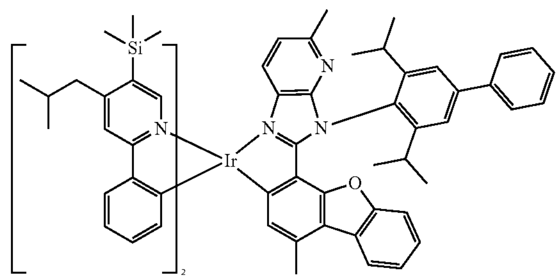
1901
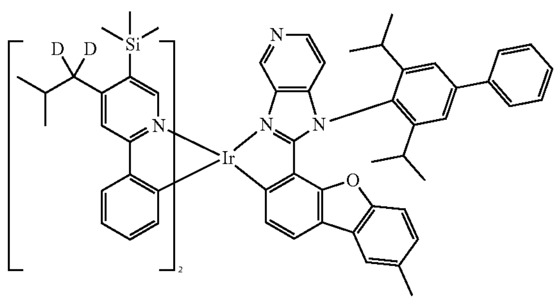
1902
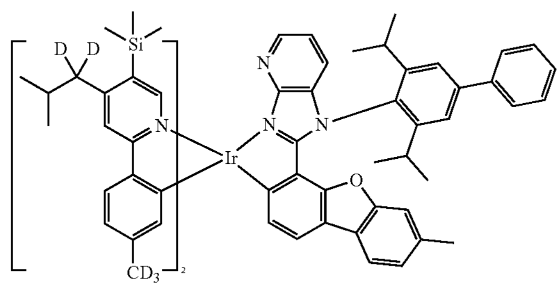
1903
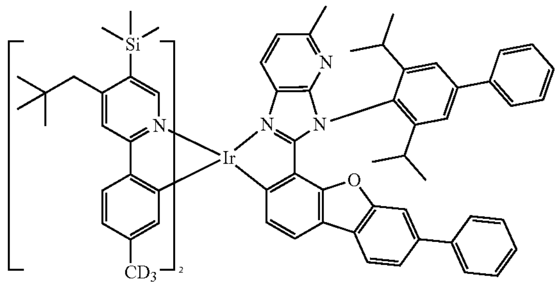
1904
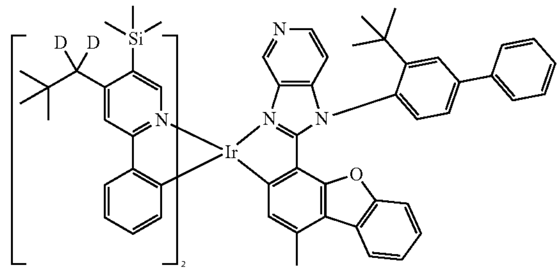
1905
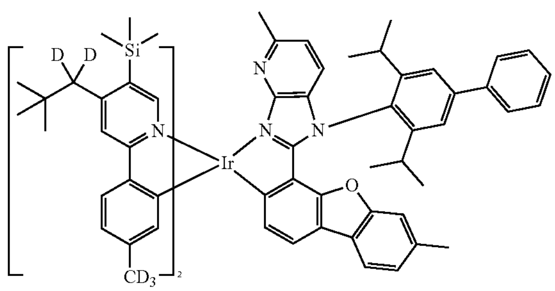
1906
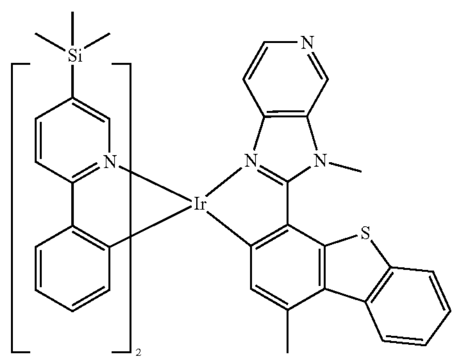

-continued
1907
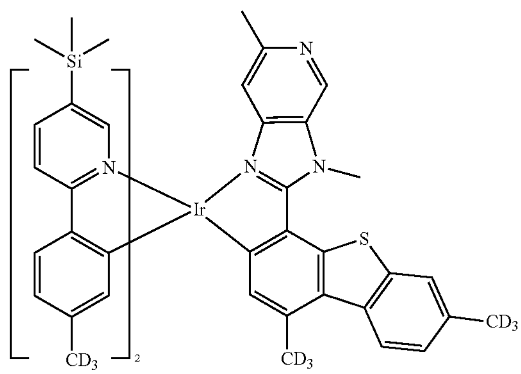
1908
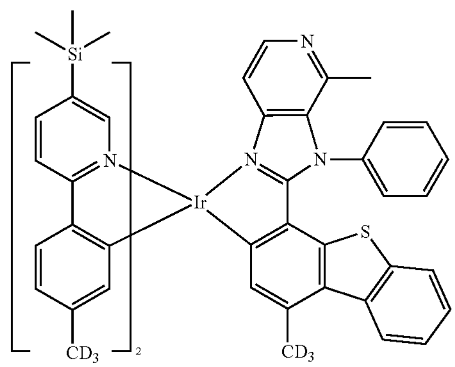
1909
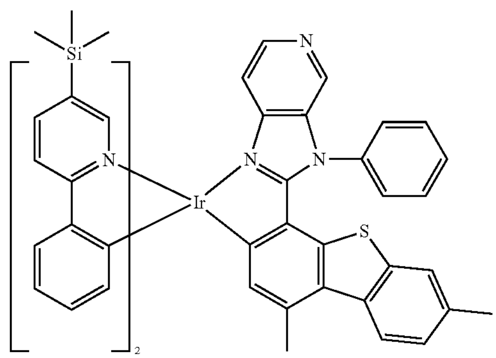
1910
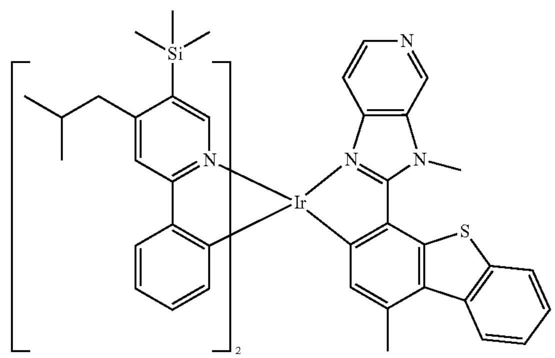
1911
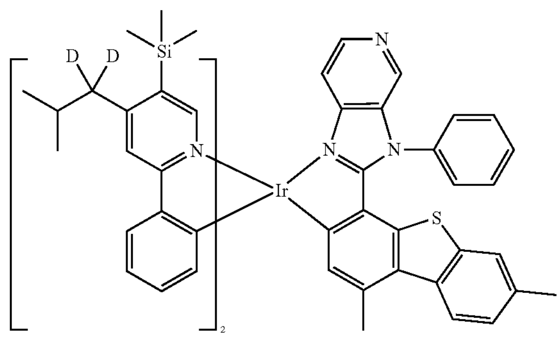
1912
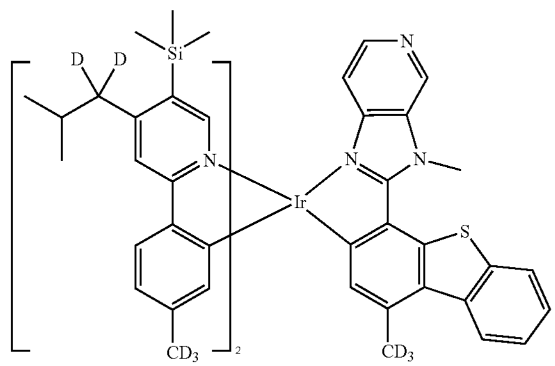
1913
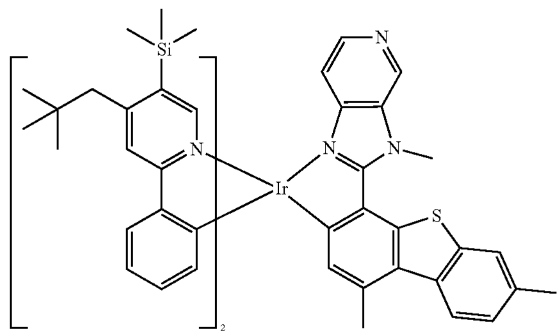
1914
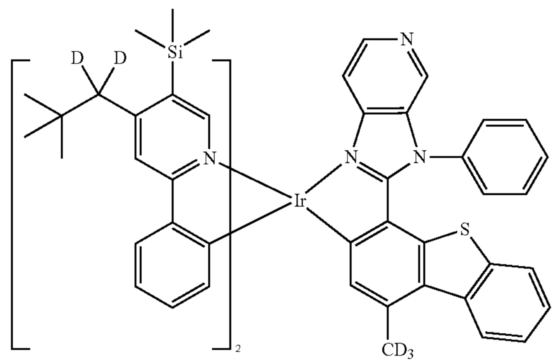

-continued
1915
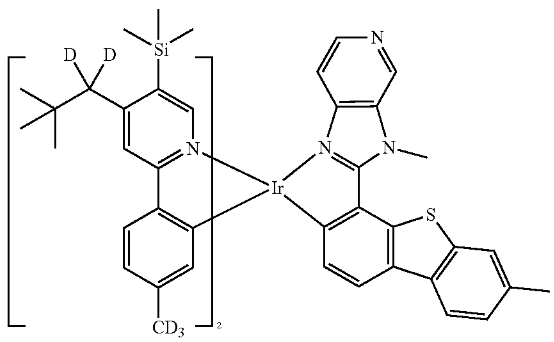
1916
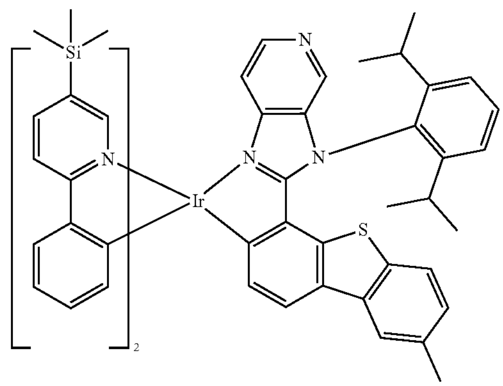
1917
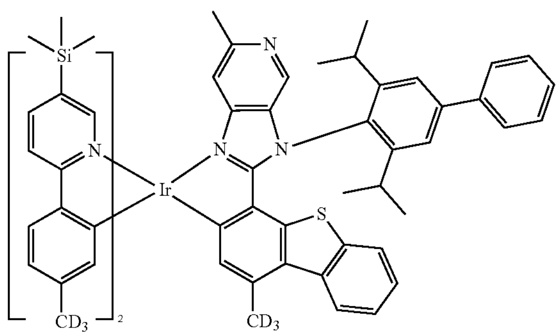
1918
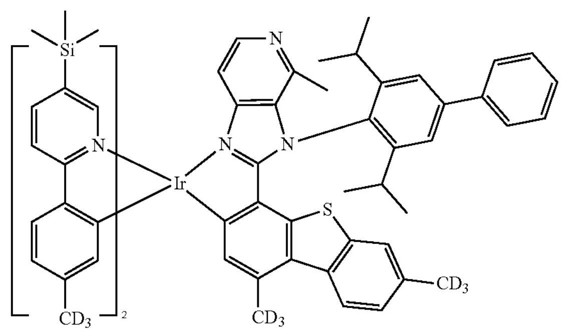
1919
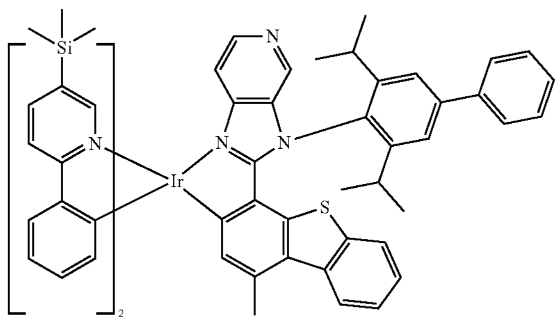
1920
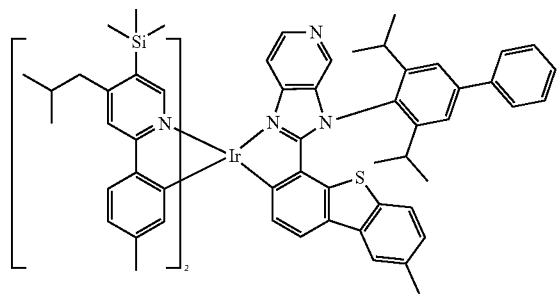
1921
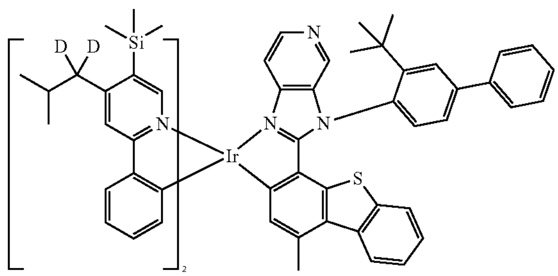
1922
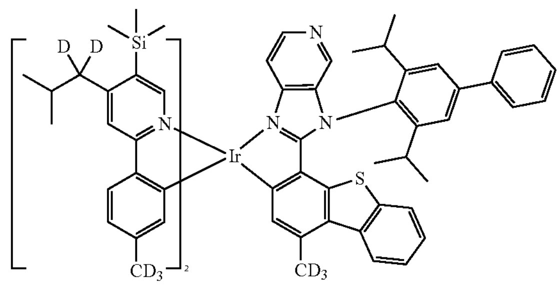

-continued
1923
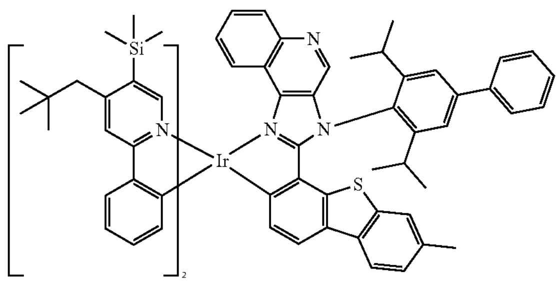
1924
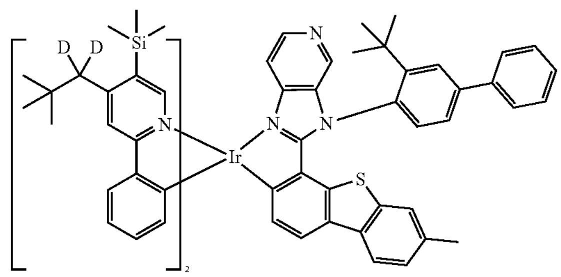
1925
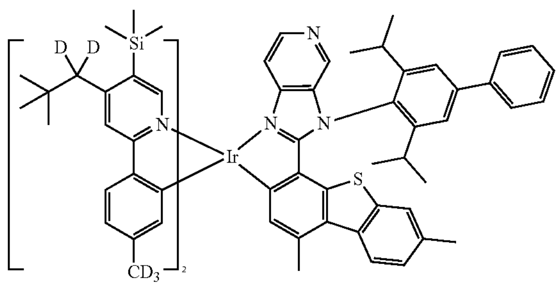
1926
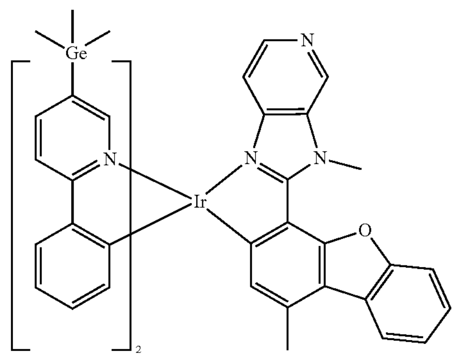
1927
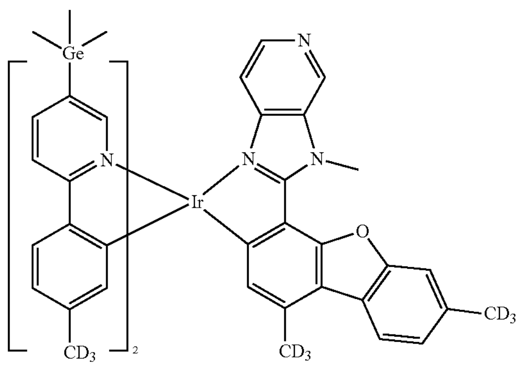
1928
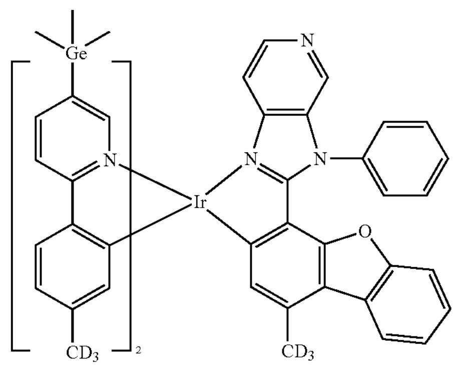
1929
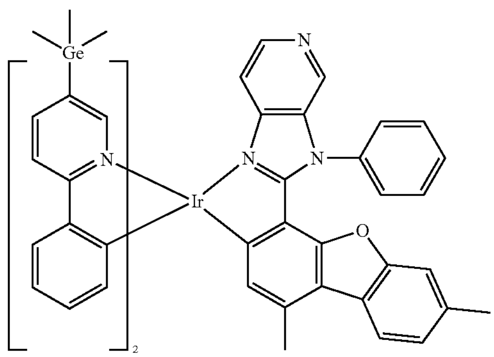
1930
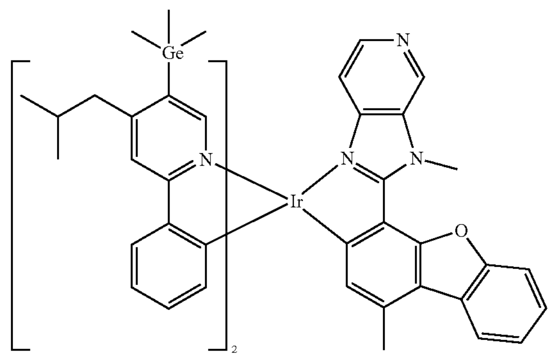

-continued
1931
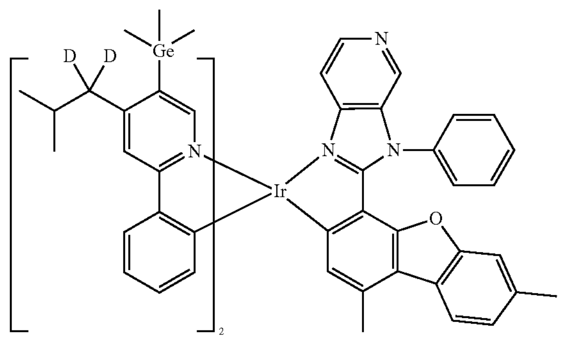
1932
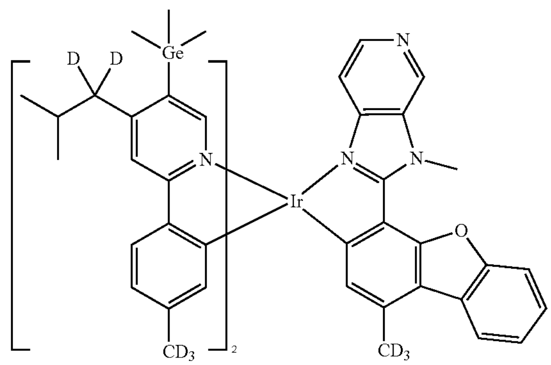
1933
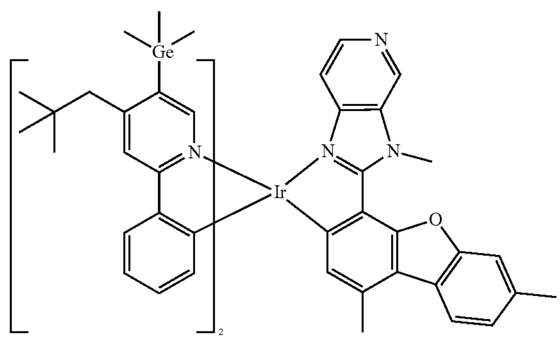
1934
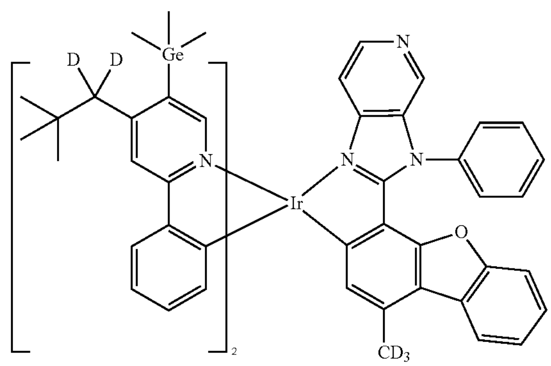
1935
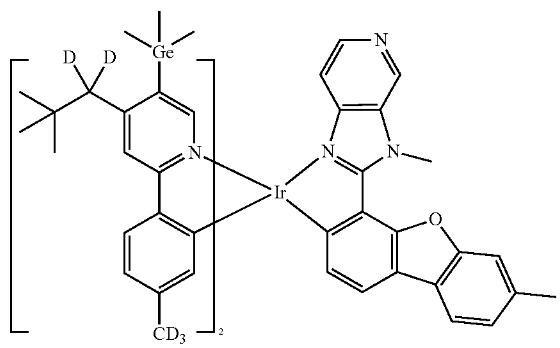
1936
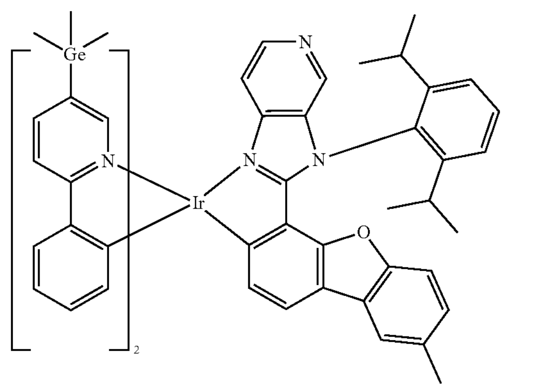
1937
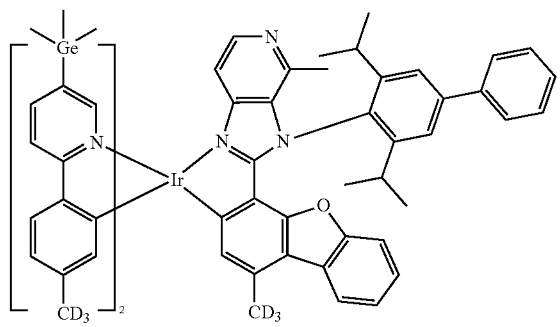
1938
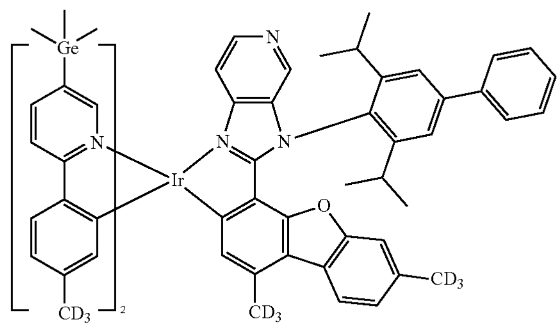

-continued
1939
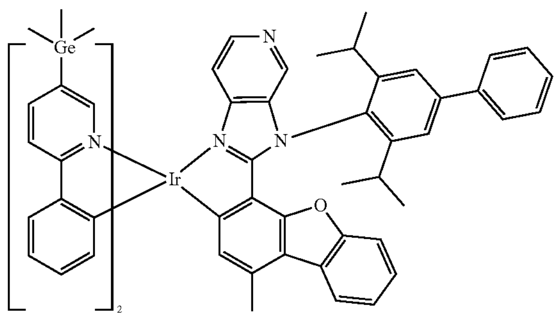
1940
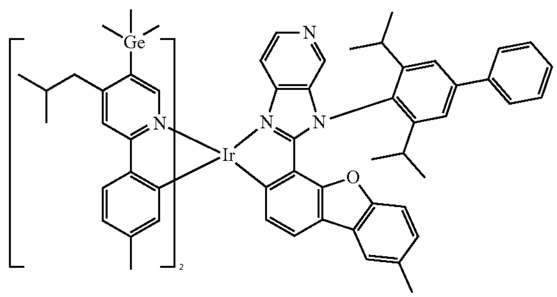
1941
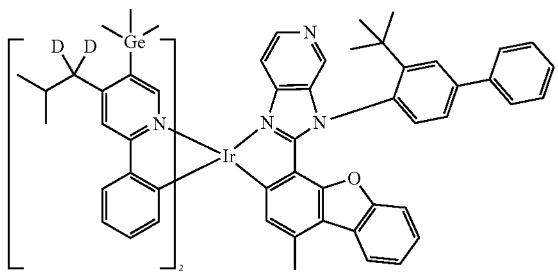
1942
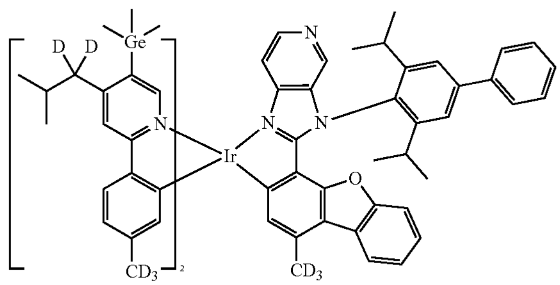
1943
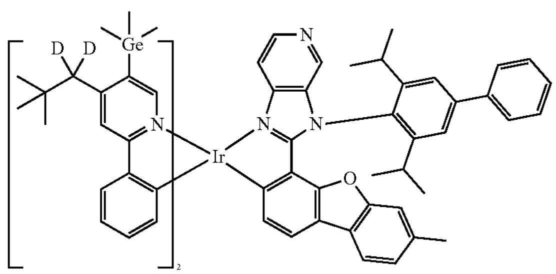
1944
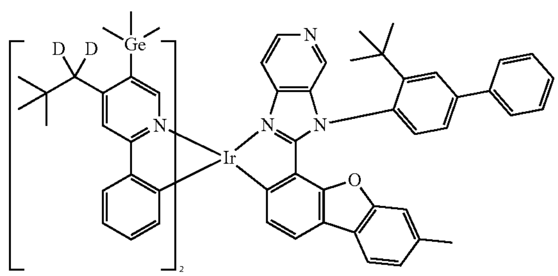
1945
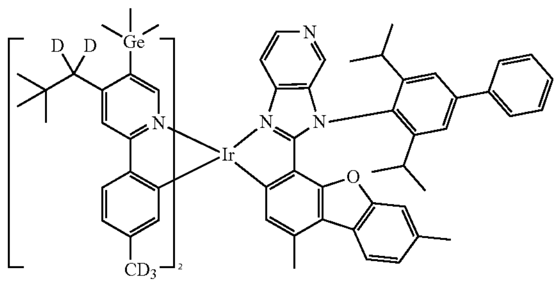
1946
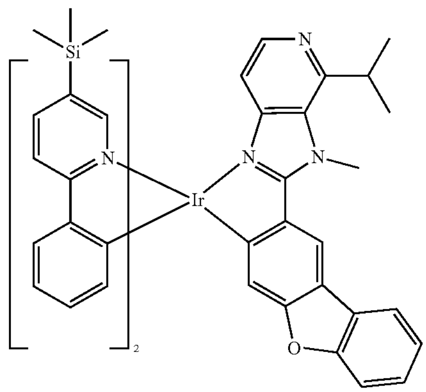

-continued
1947
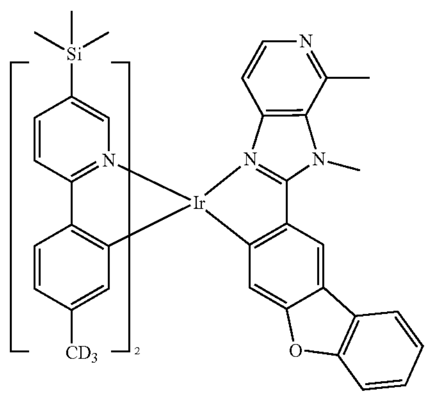
1948
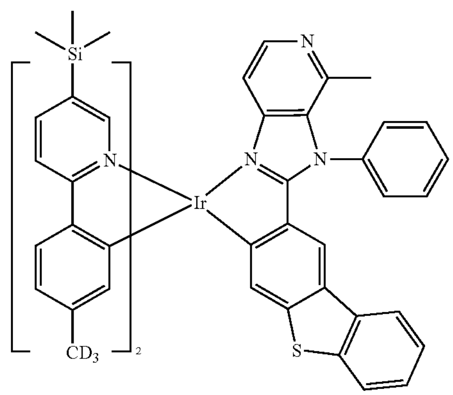
1949
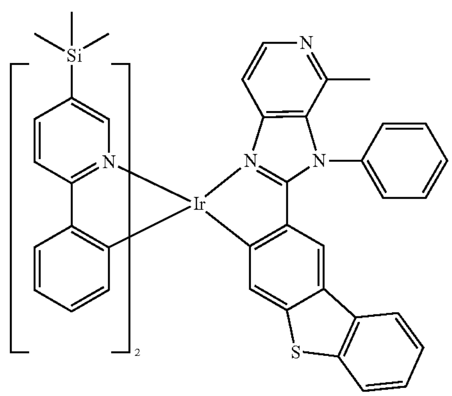
1950
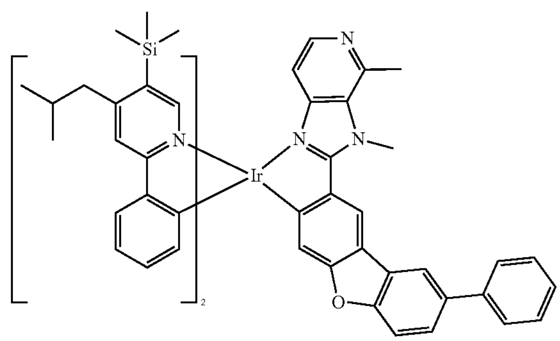
1951
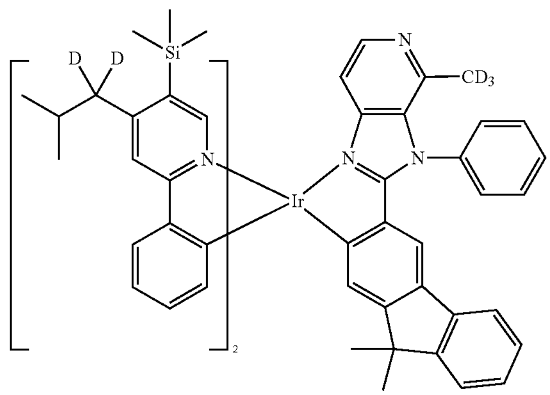
1952
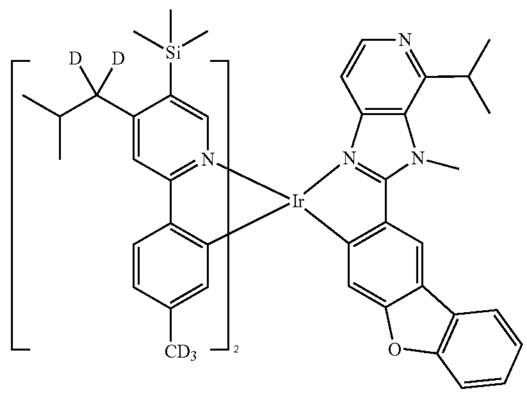
1953
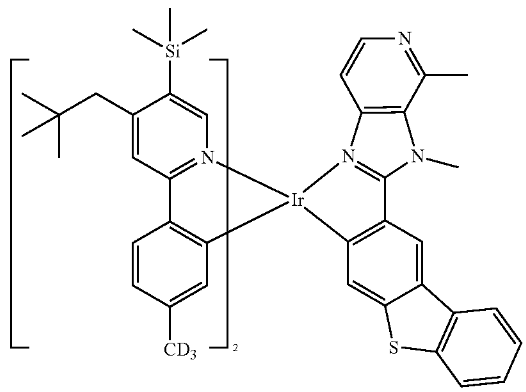
1954
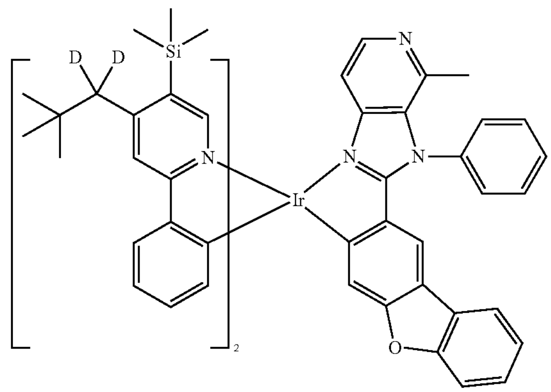

-continued
1955
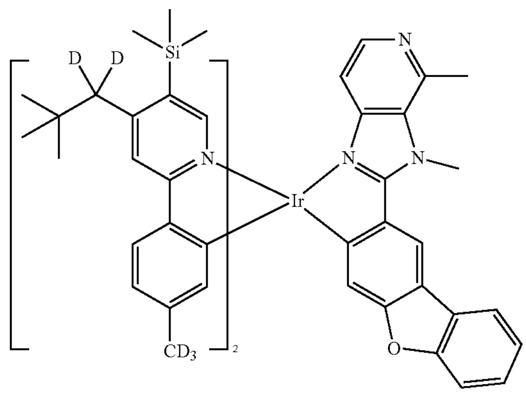
1956
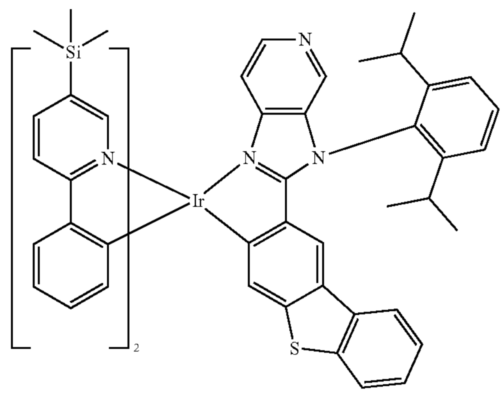
1957
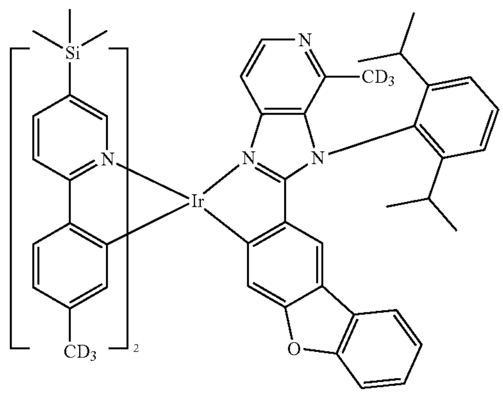
1958
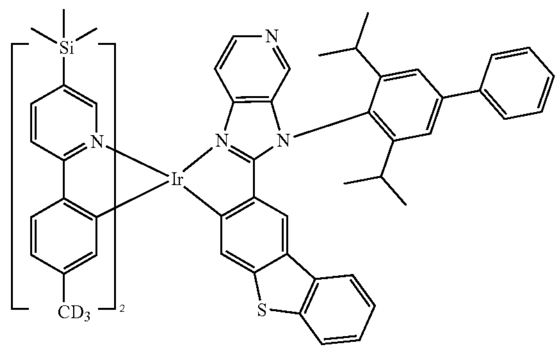
1959
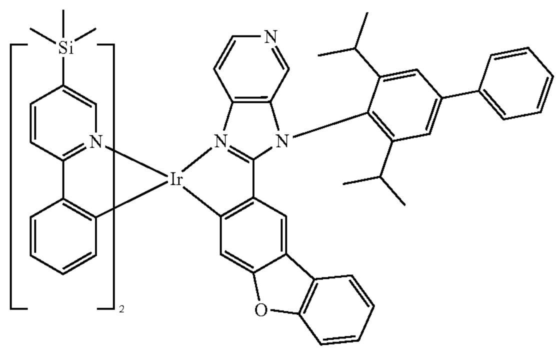
1960
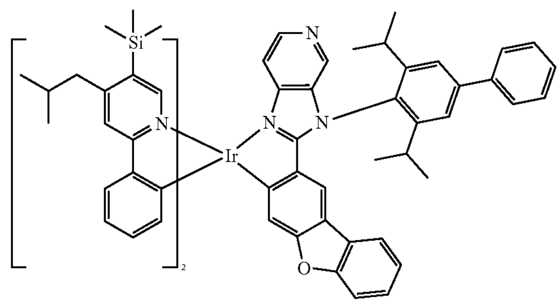
1961
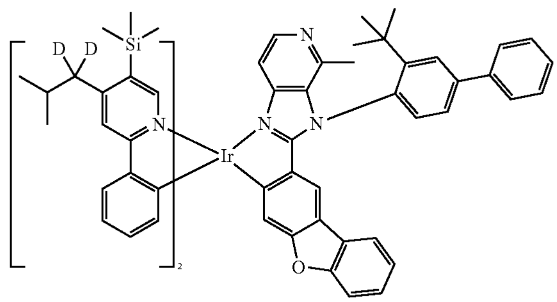
1962
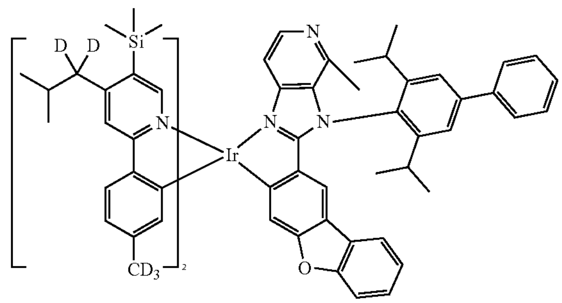

-continued
1963
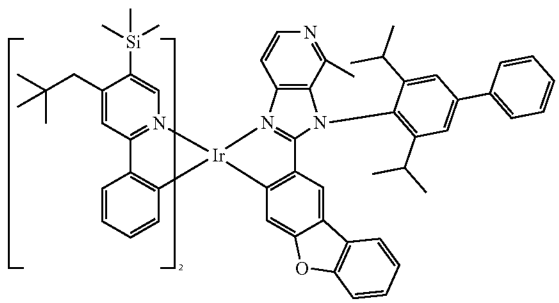
1964
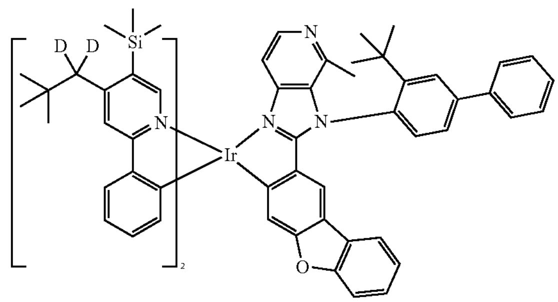
1965
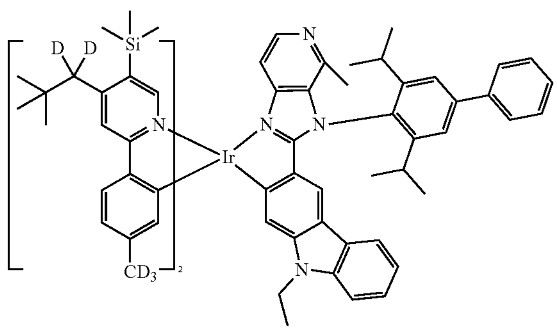
1966
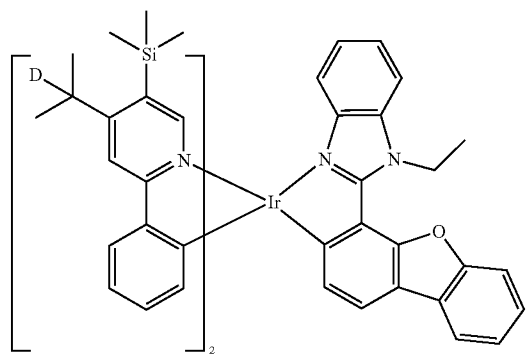
1967
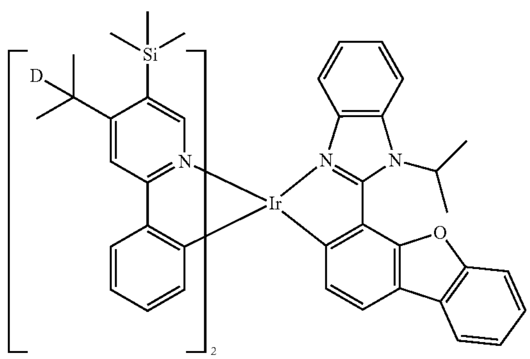
1968
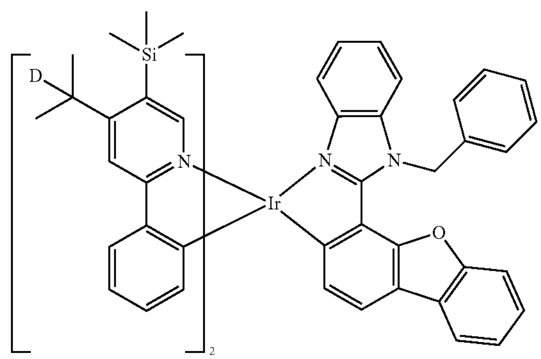
1969
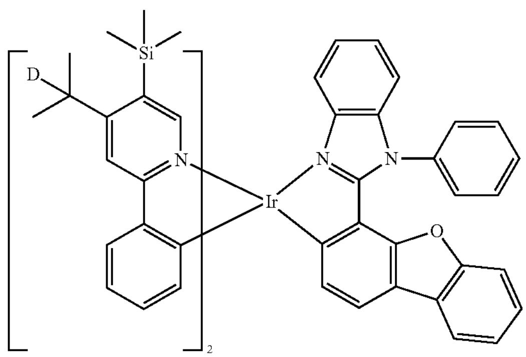
1970
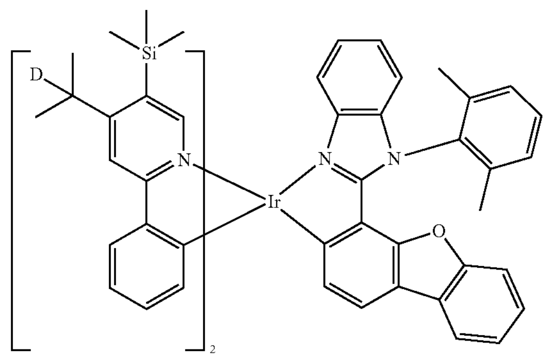

-continued
1971
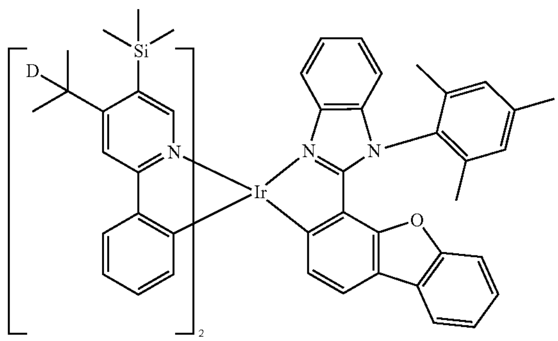
1972
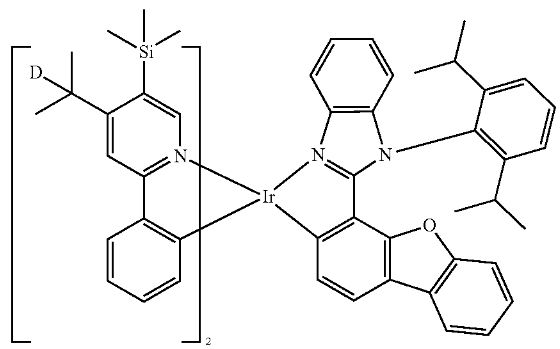
1973
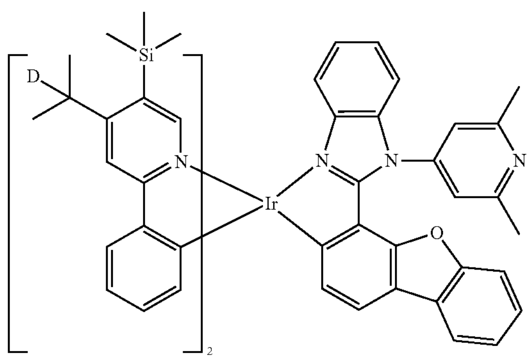
1974
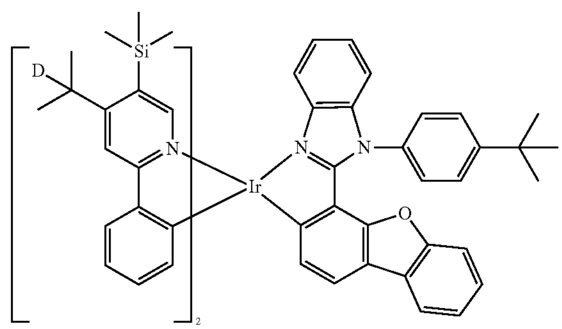
1975
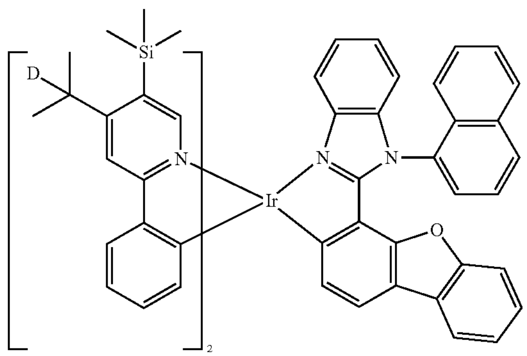
1976
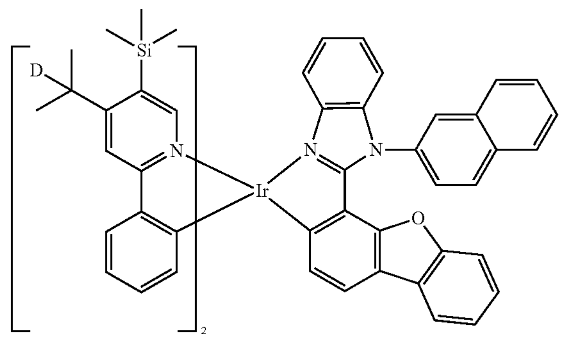
1977
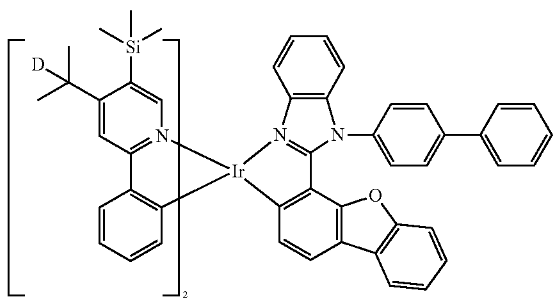
1978
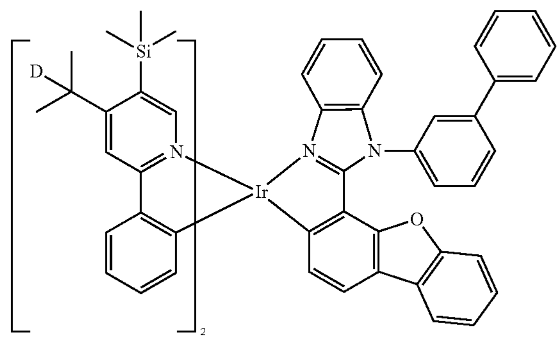

-continued
1979
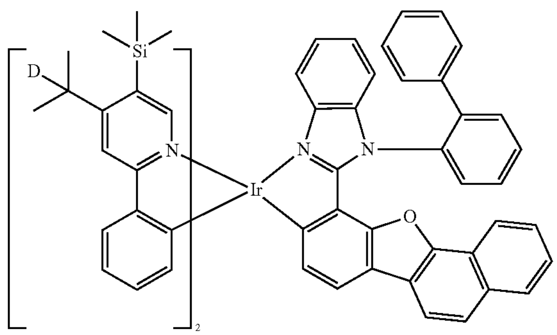
1980
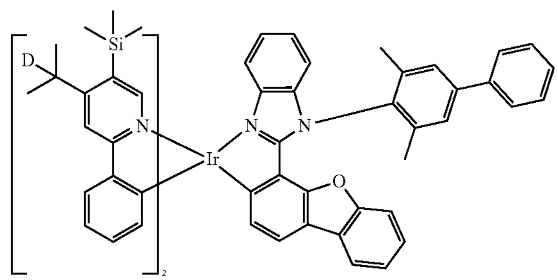
1981
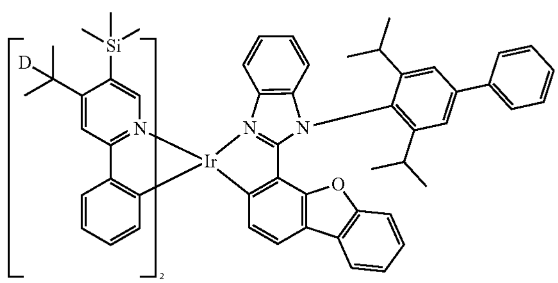
1982
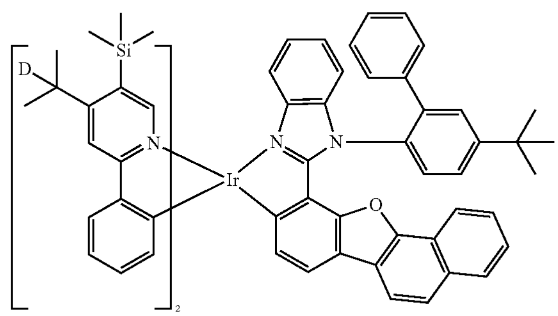
1983
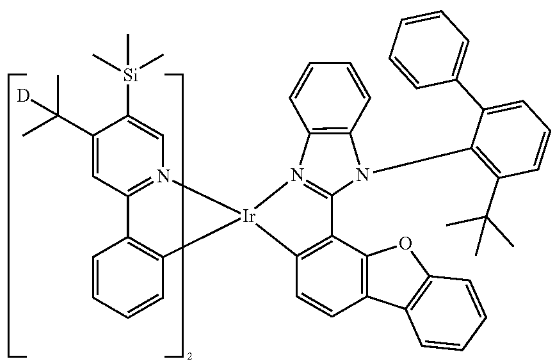
1984
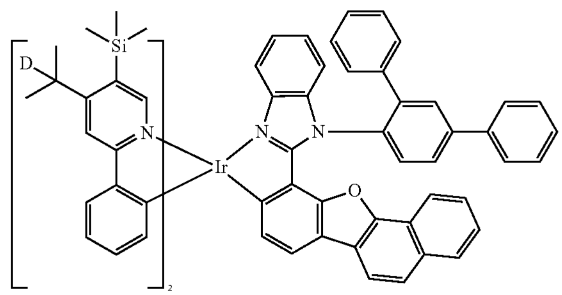
1985
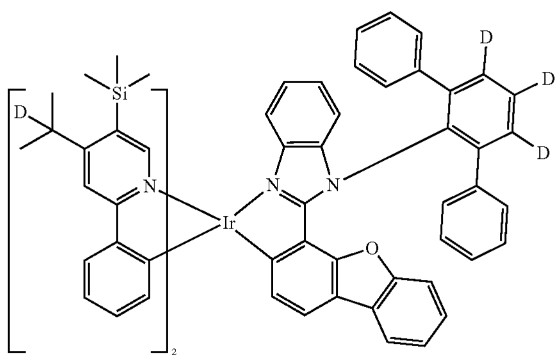
1986
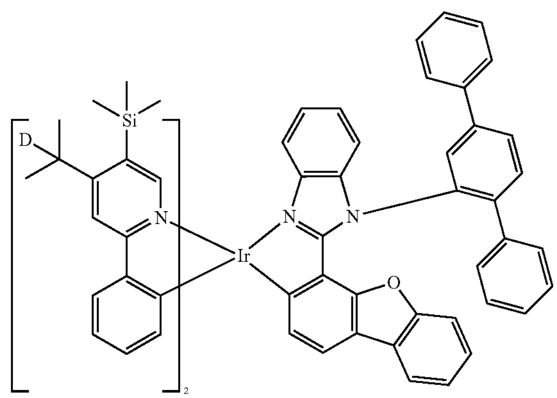

-continued
1987
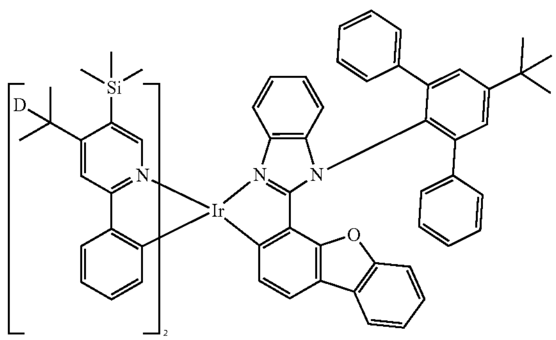
1988
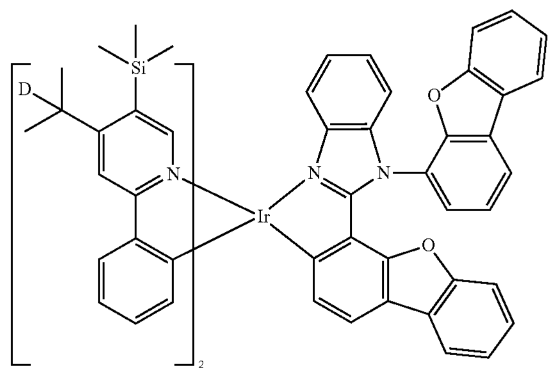
1989
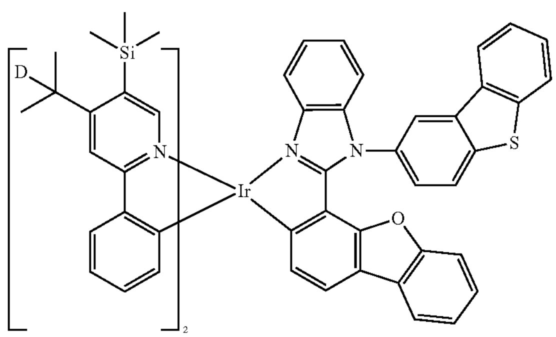
1990
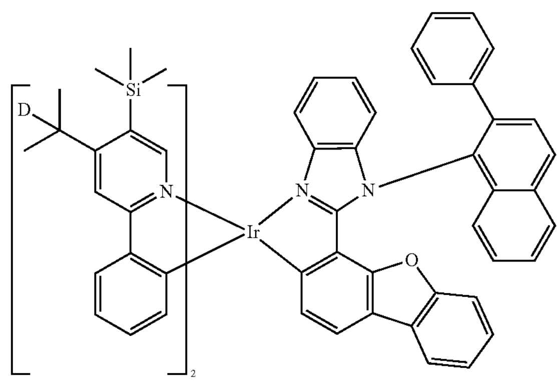
1991
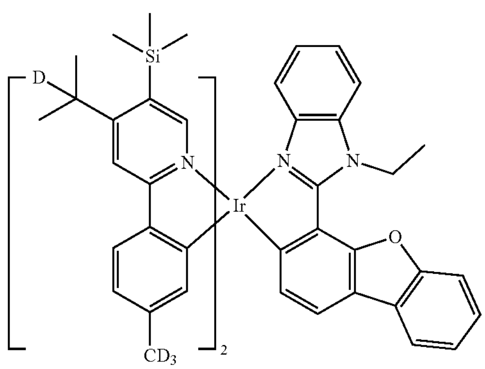
1992
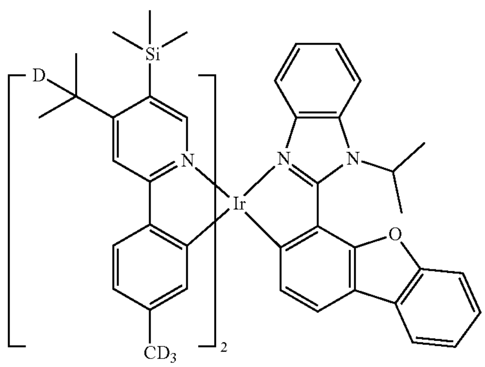
-continued
1993
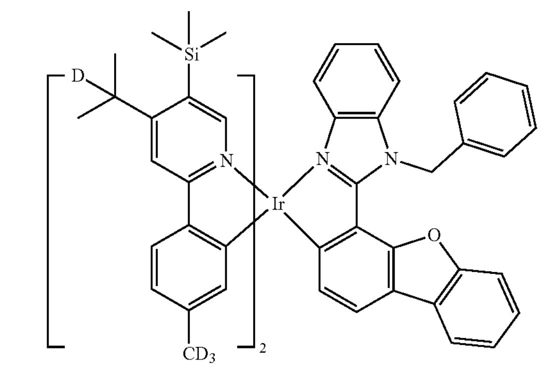
1994
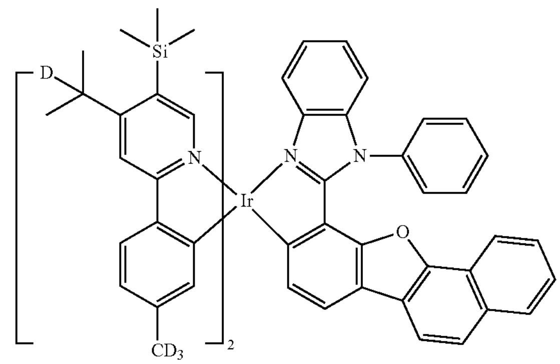

-continued
1995
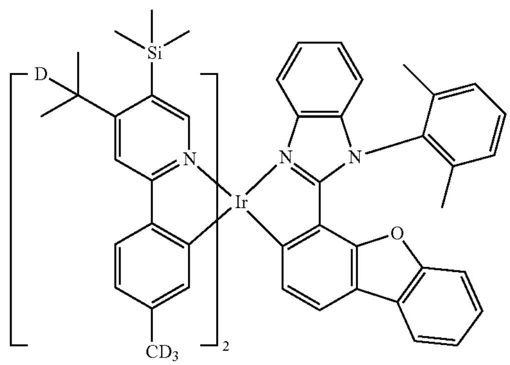
1996
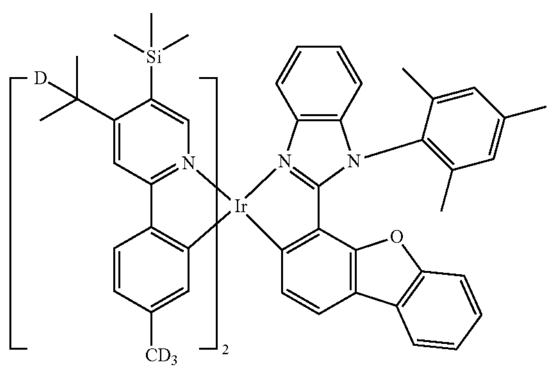
1997
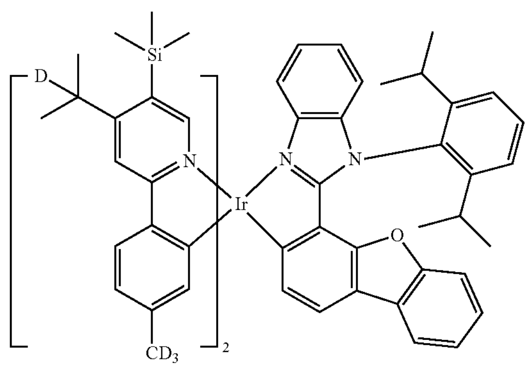
1998
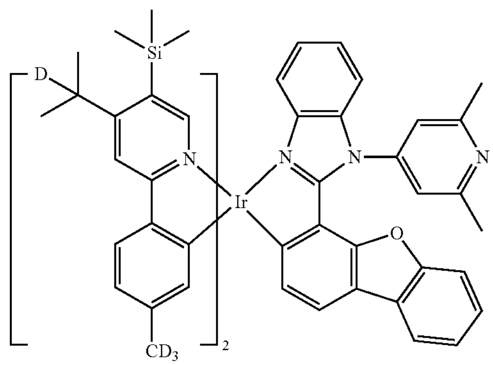
-continued
1999
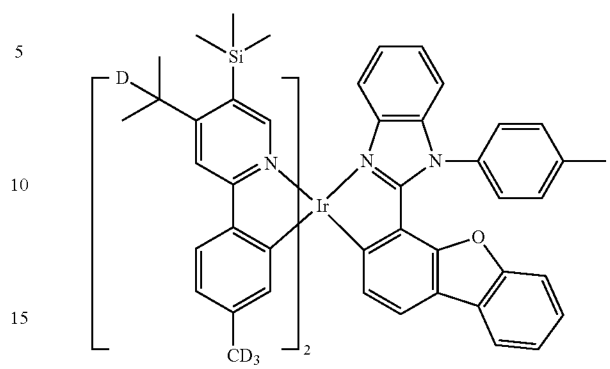
2000
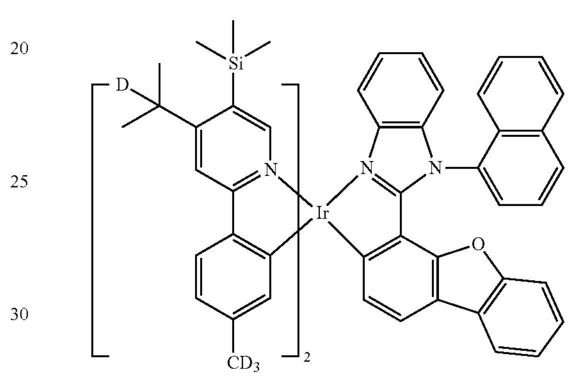
2001
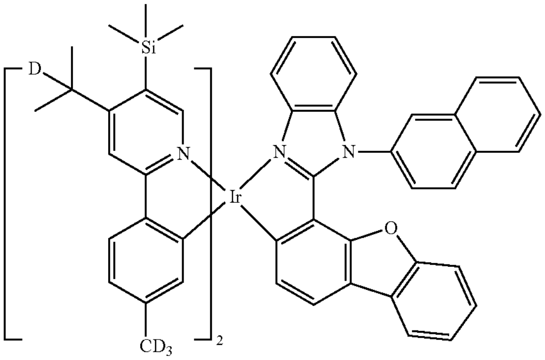
2002
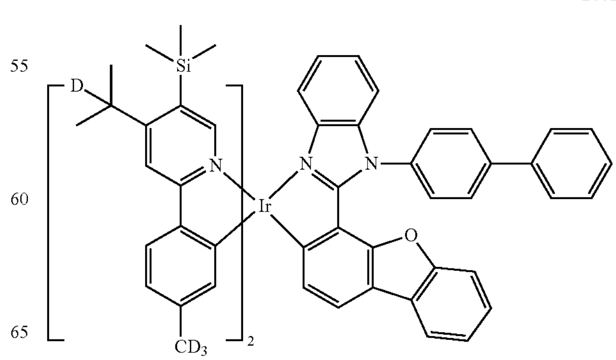

-continued
2003
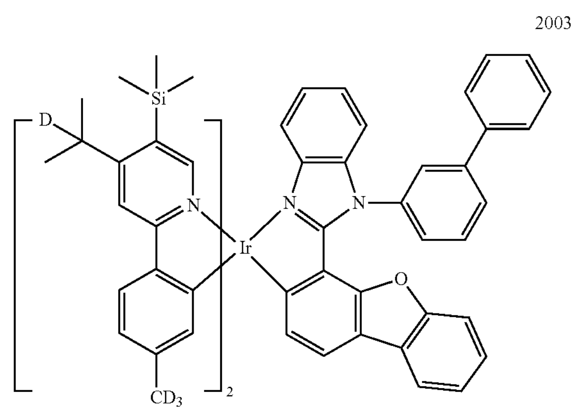
2004
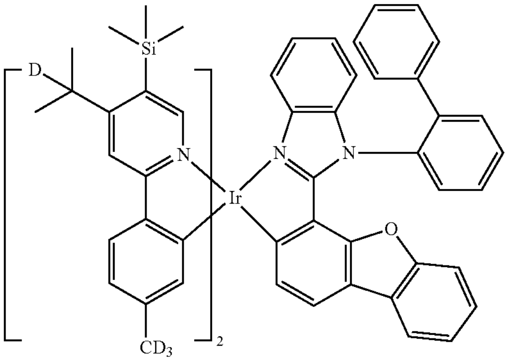
2005
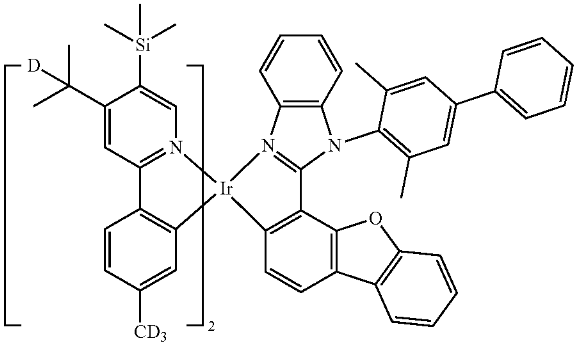
2006
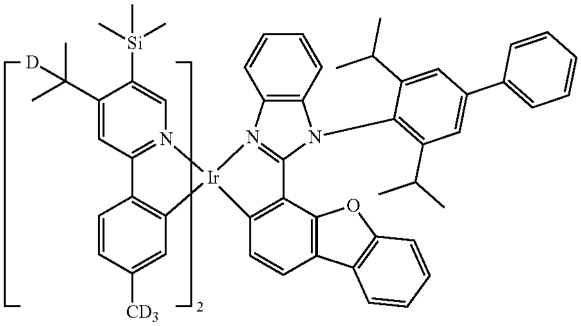
-continued
2007
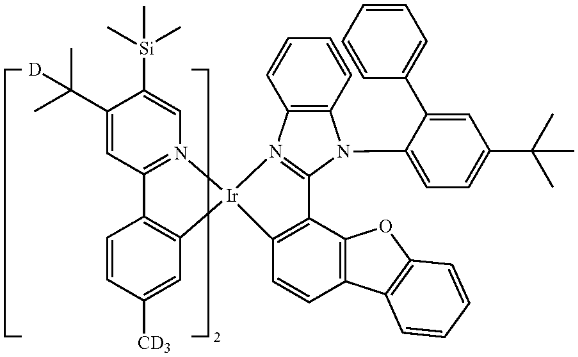
2008
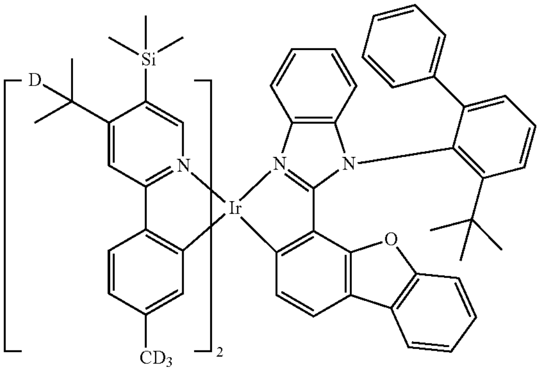
2009
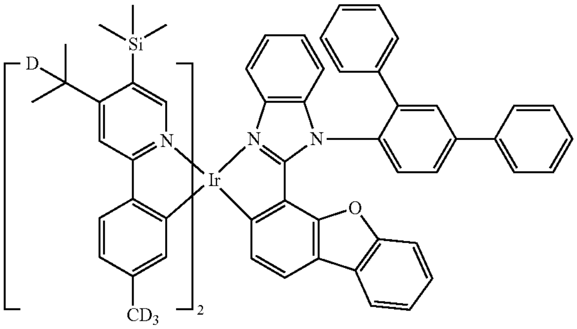
2010
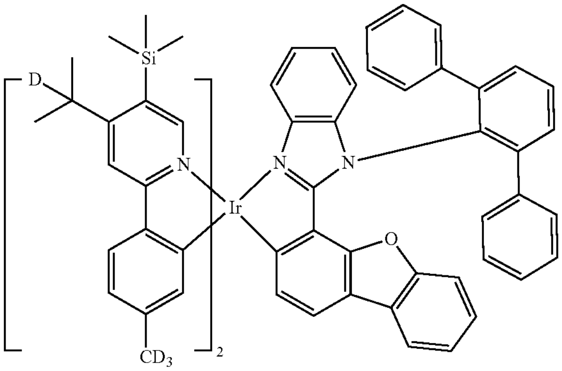

-continued
2011
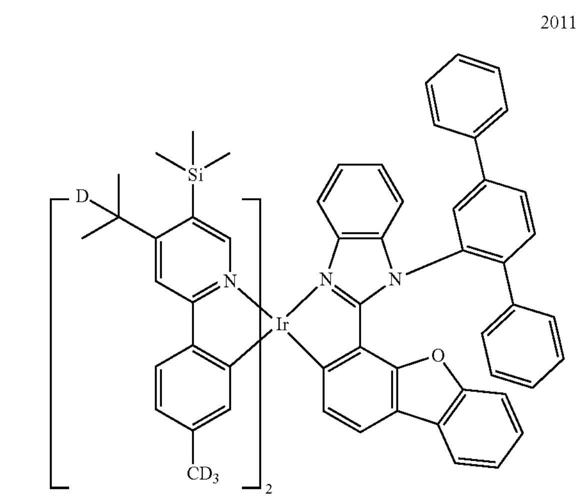
2012
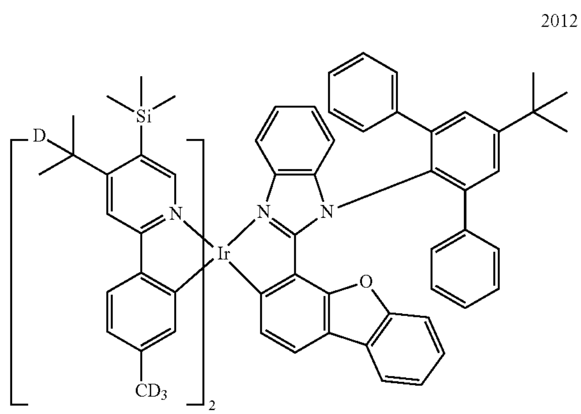
2013
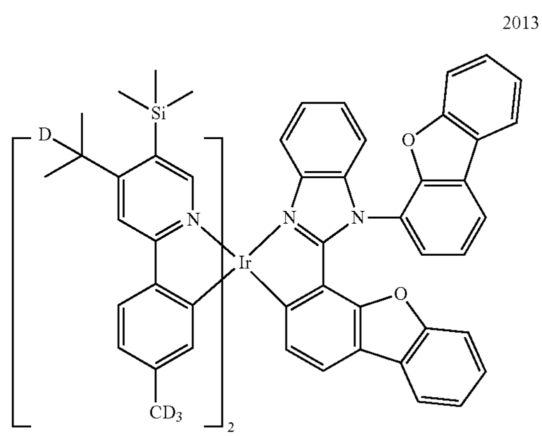
-continued
2014
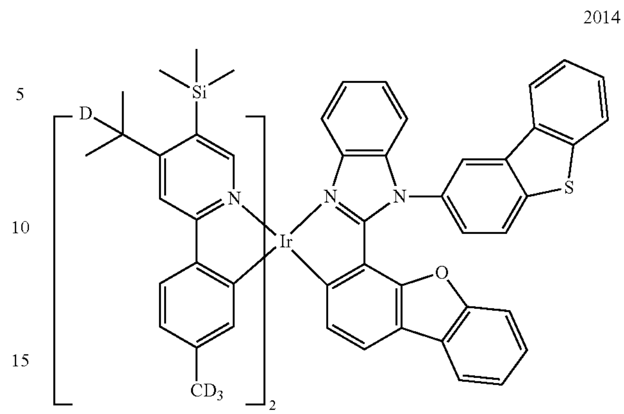
2015
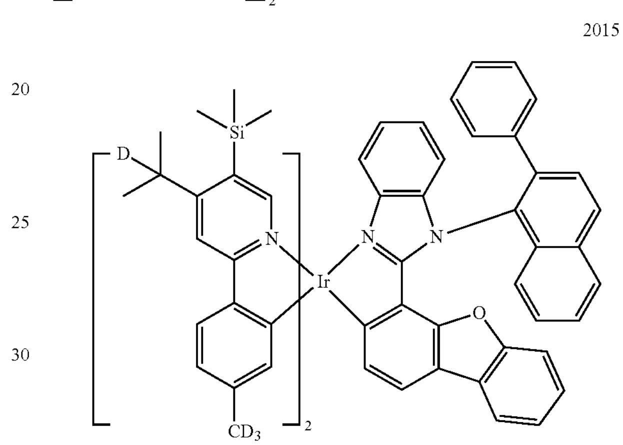
2016
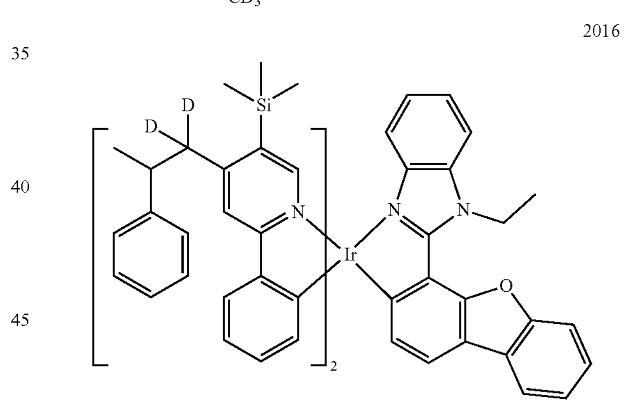
2017
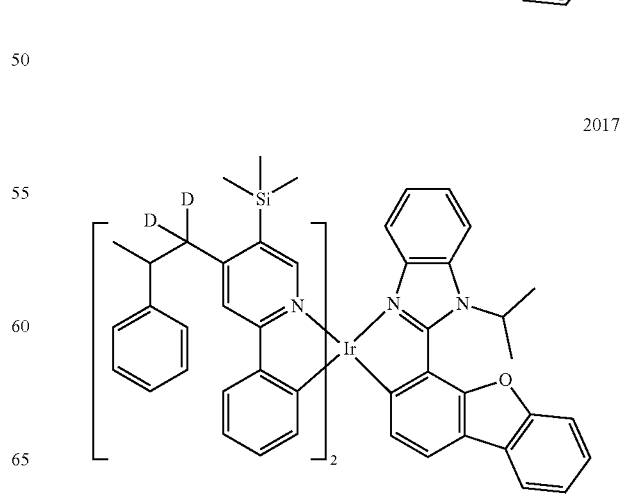

-continued
2018
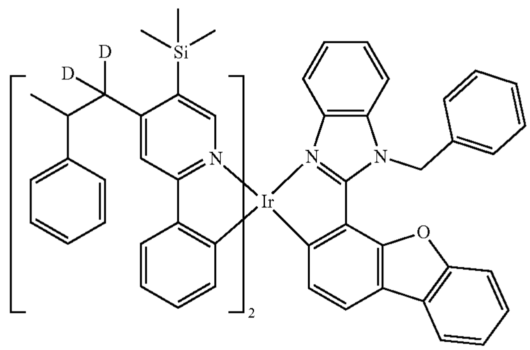
2019
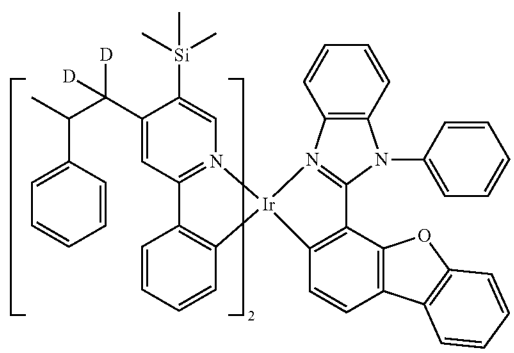
2020
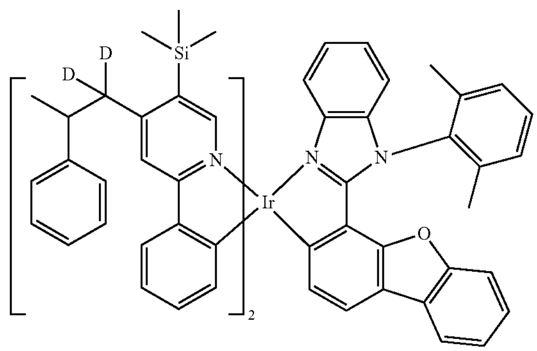
2021
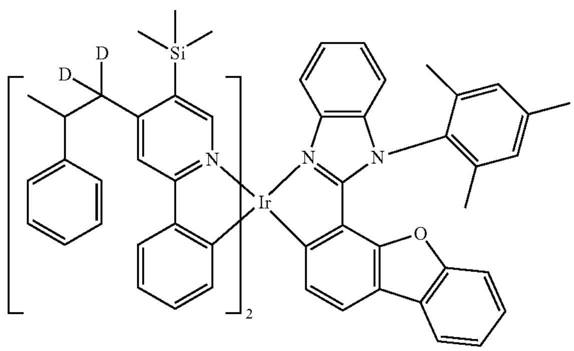
-continued
2022
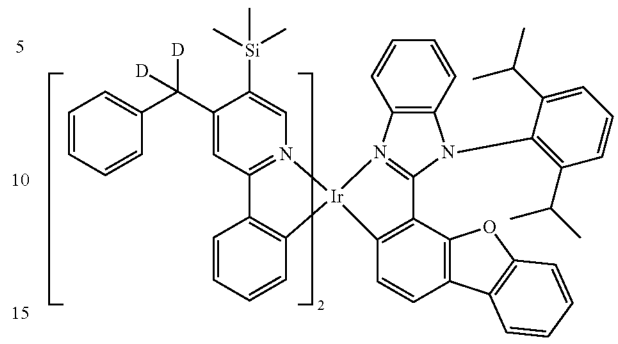
2023
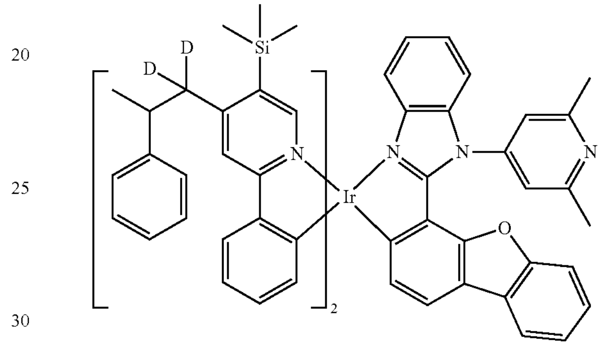
2024
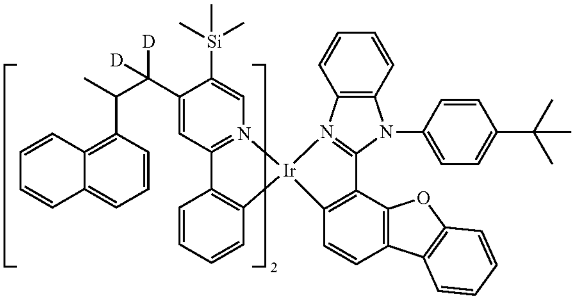
2025
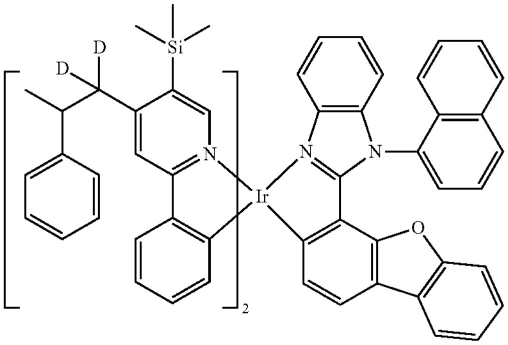

-continued
2026
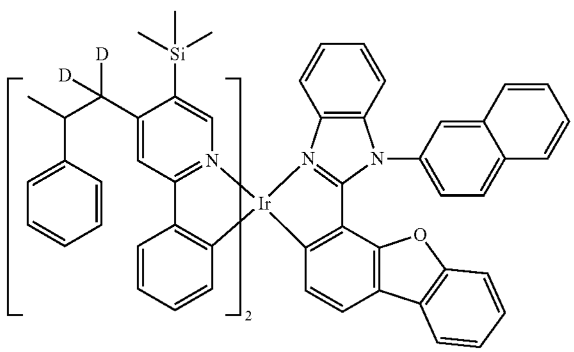
2027
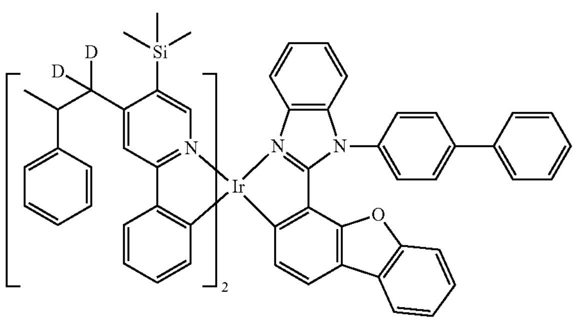
2028
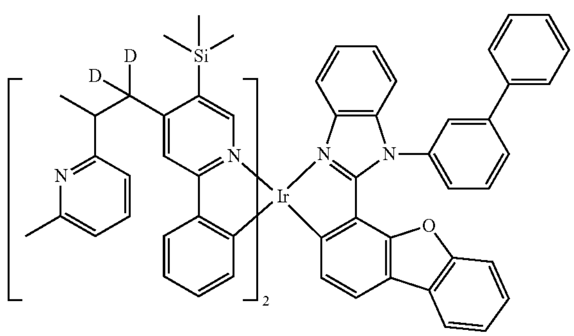
2029
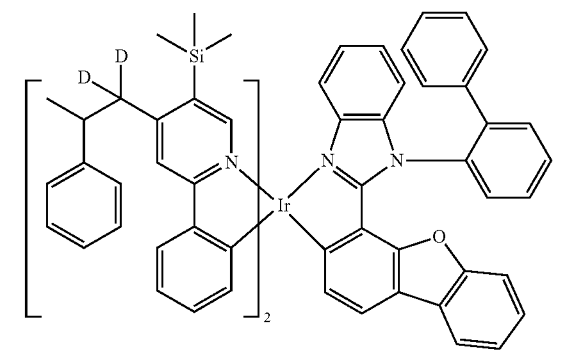
-continued
2030
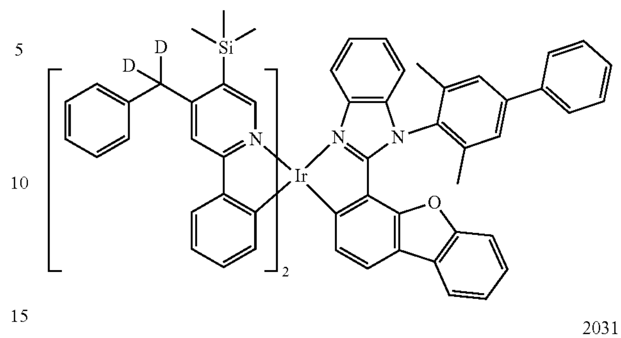
2031
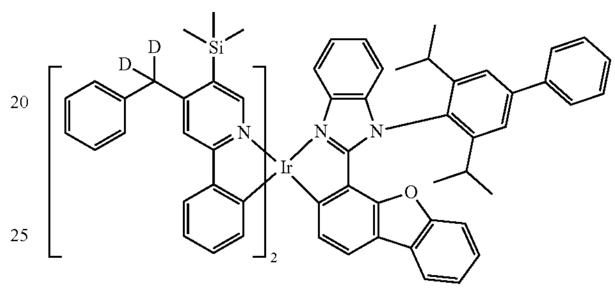
2032
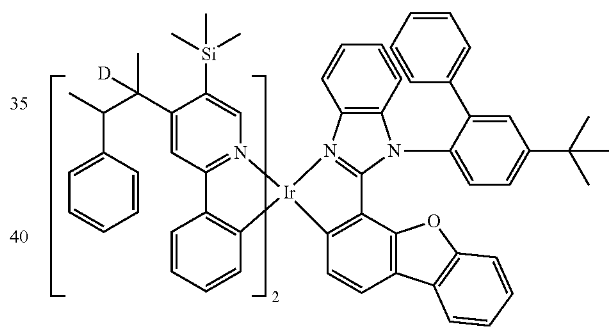
2033
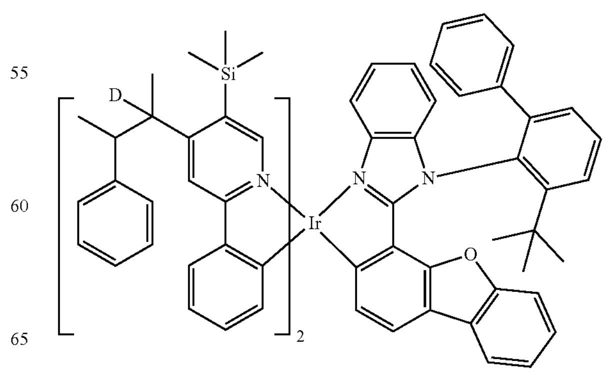

-continued
2034
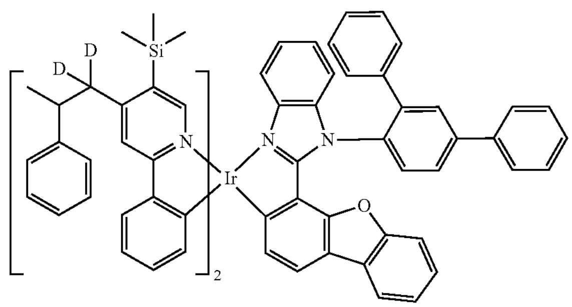
2035
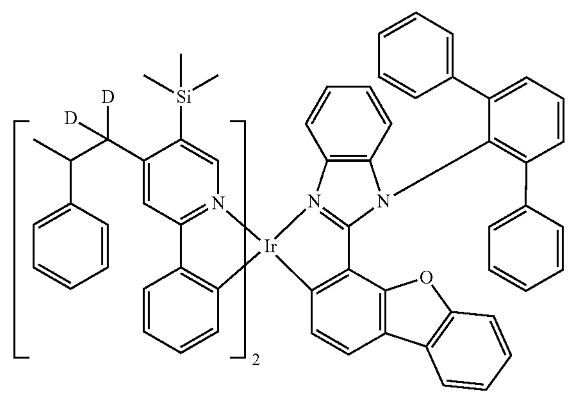
2036
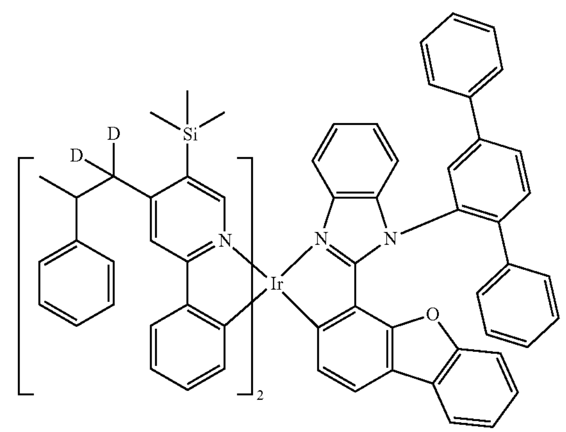
2037
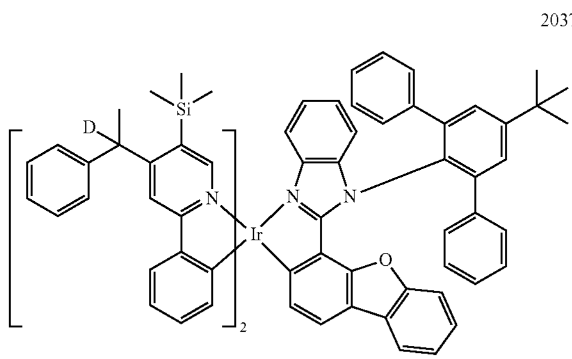
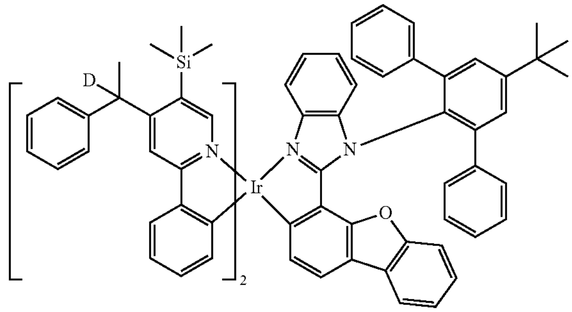
-continued
2038
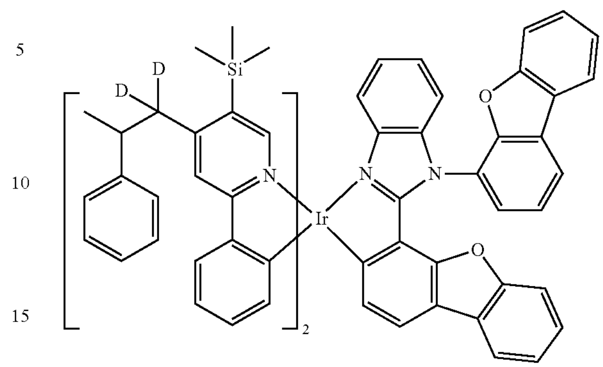
2039
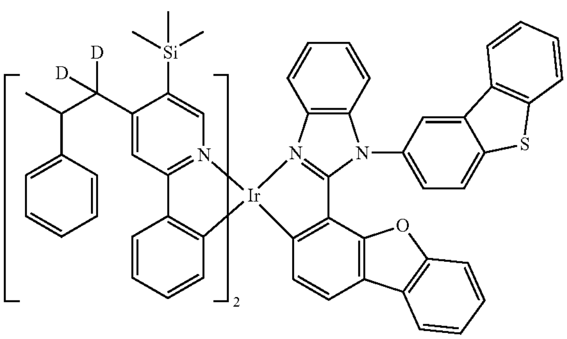
2040
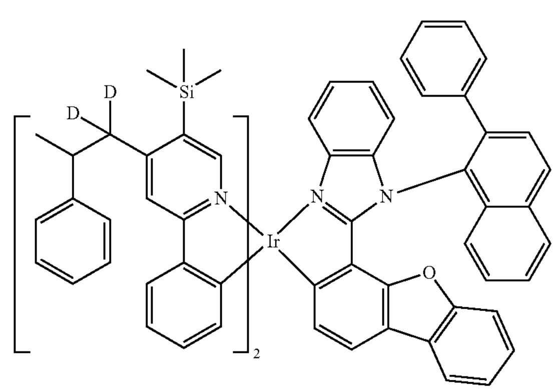
2041
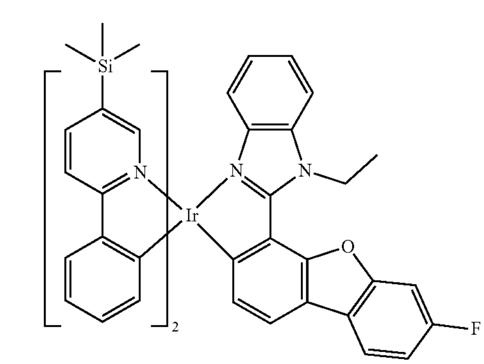

-continued
2042
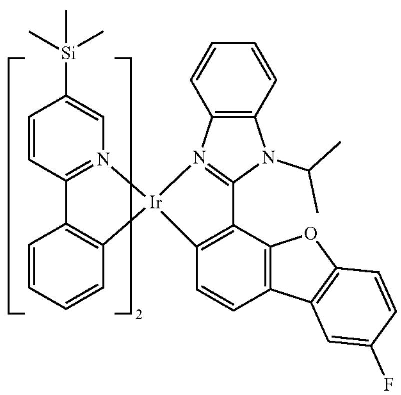
2043
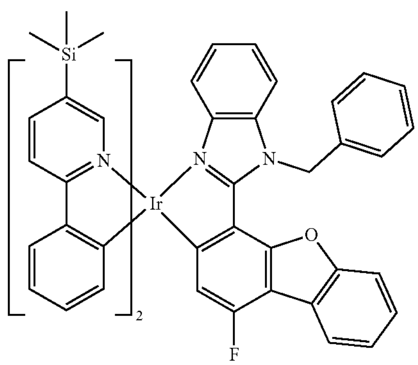
2044
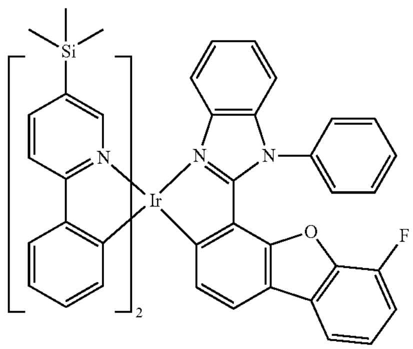
2045
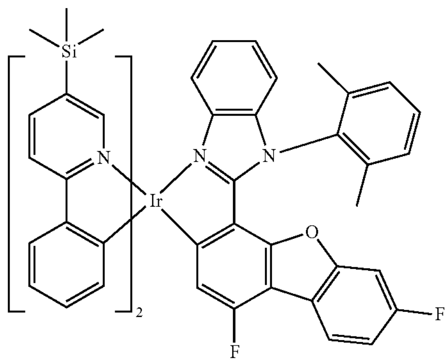
2046
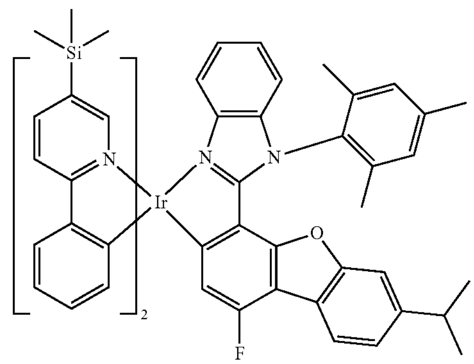
2047
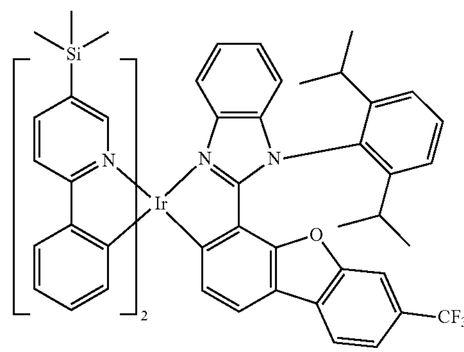
2048
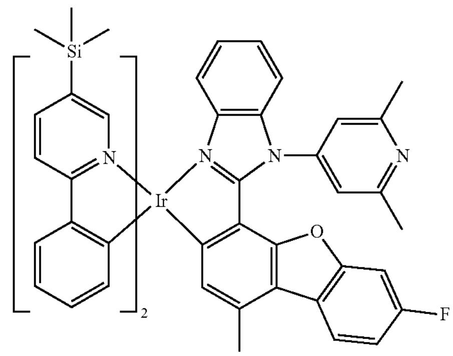
2049
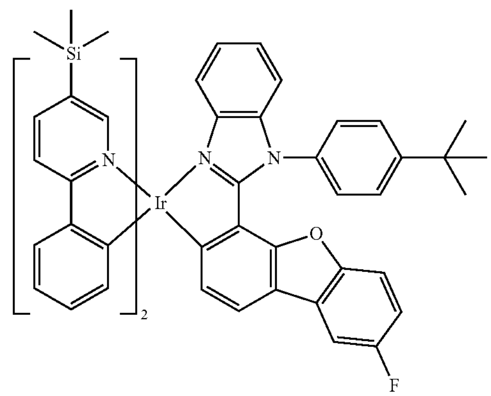

-continued
2050
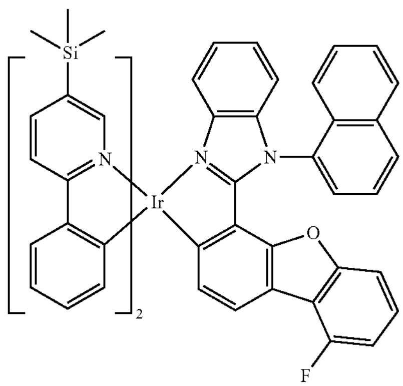
2051
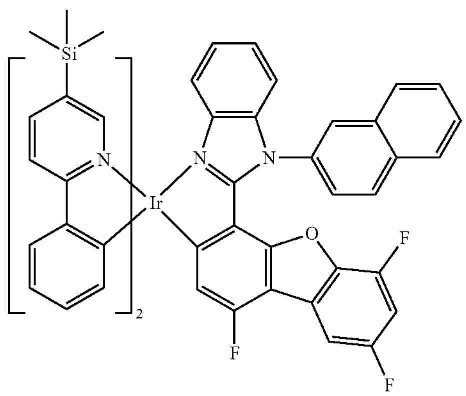
2052
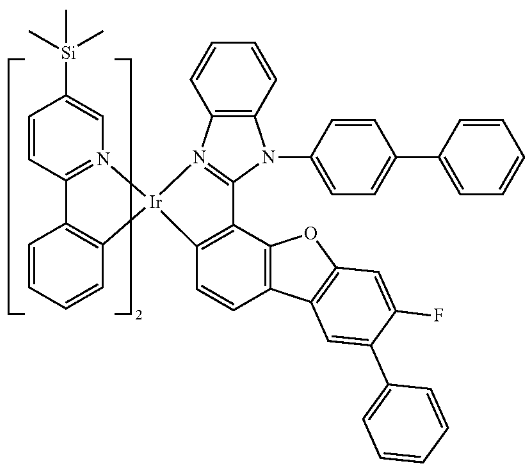
-continued
2053
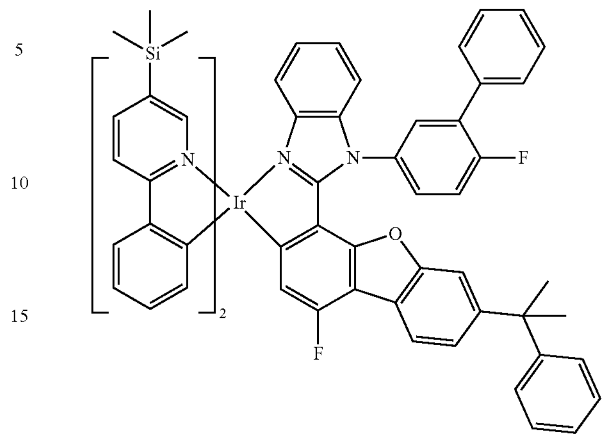
2054
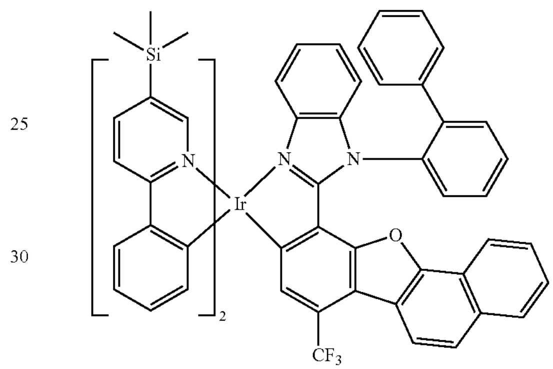
2055
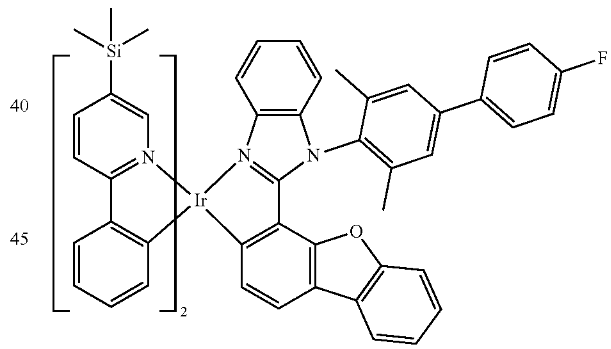
2056
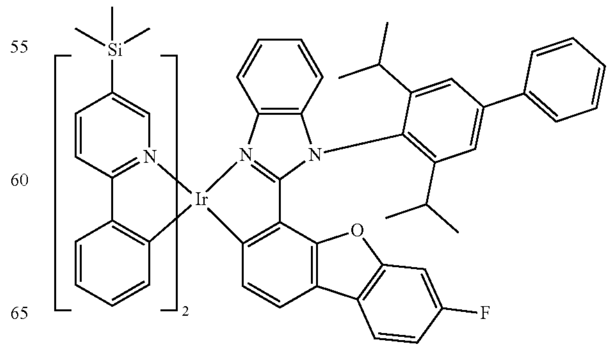

-continued
2057
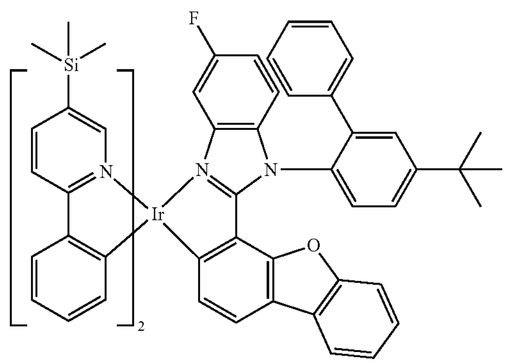
2058
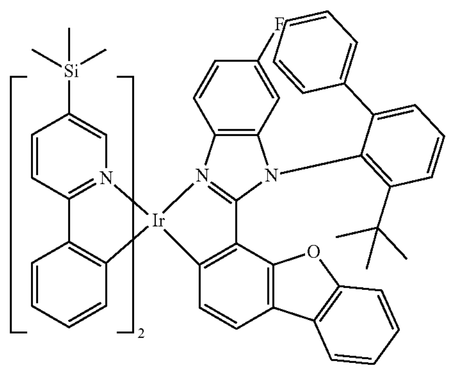
2059
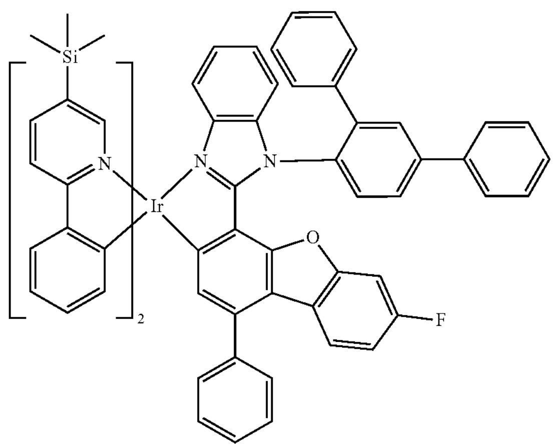
2060
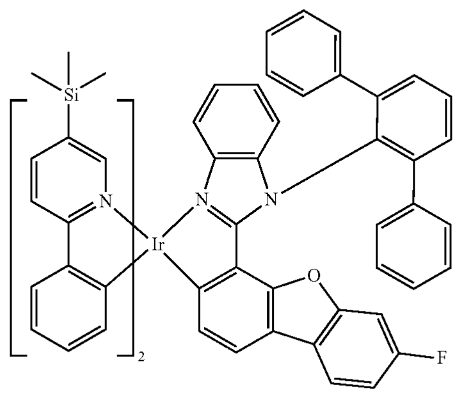
-continued
2061
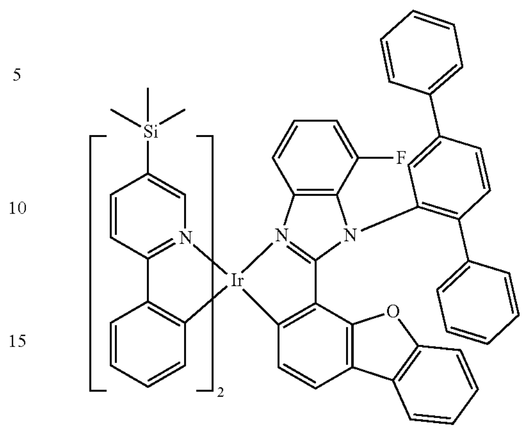
2062
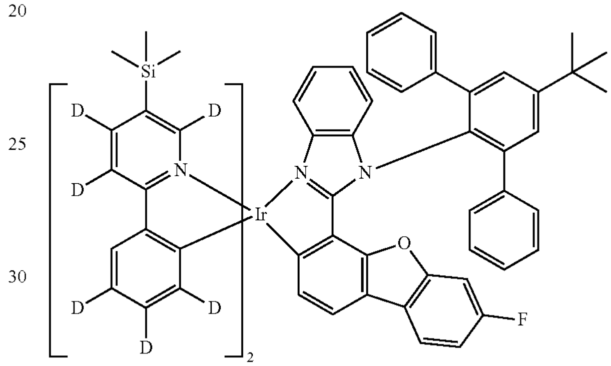
2063
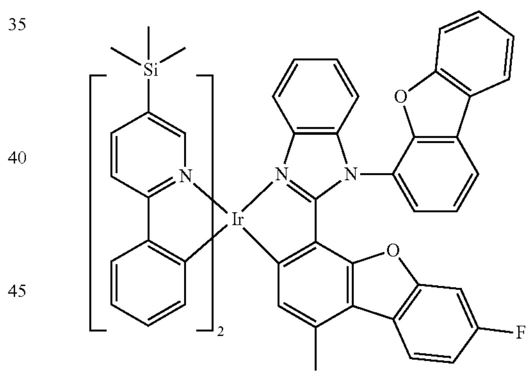
2064
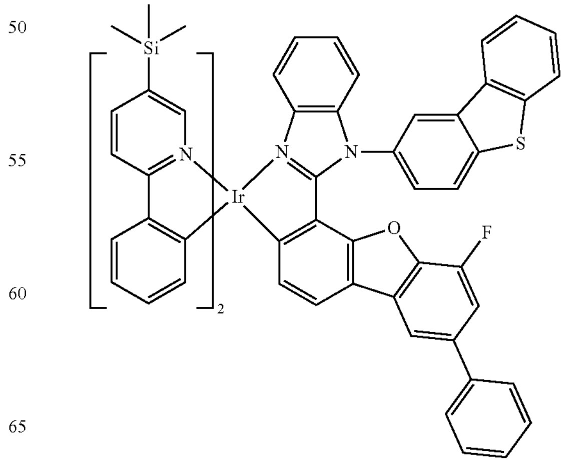

-continued
2065
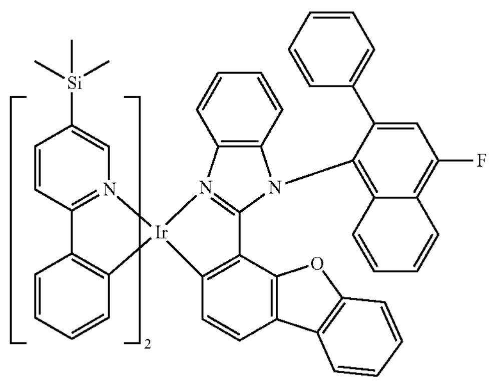
2066
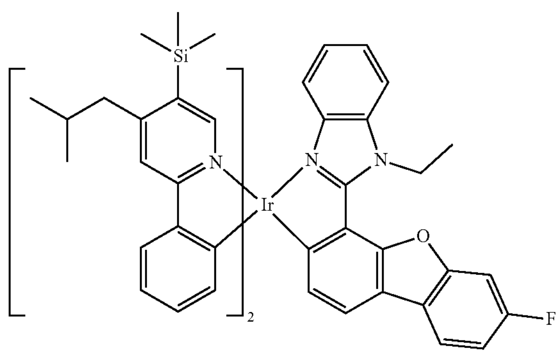
2067
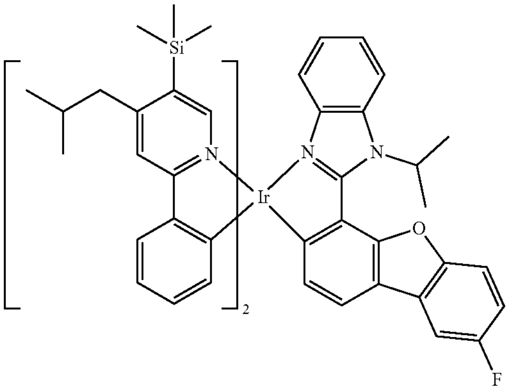
2068
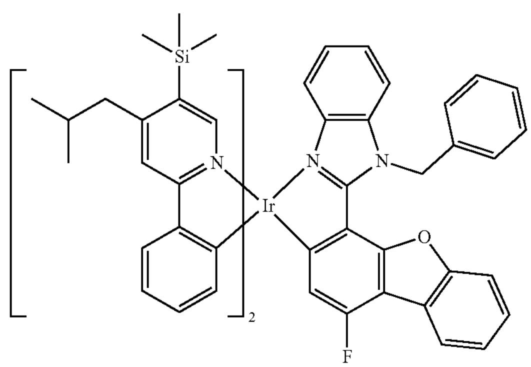
-continued
2069
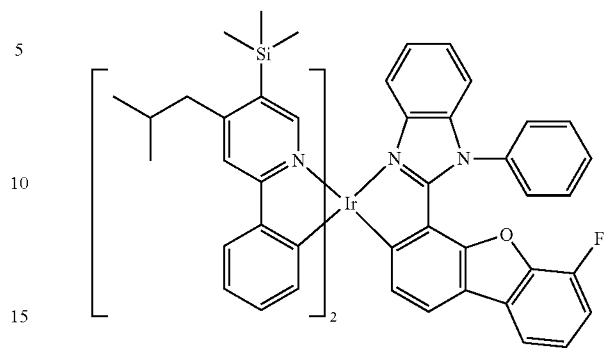
2070
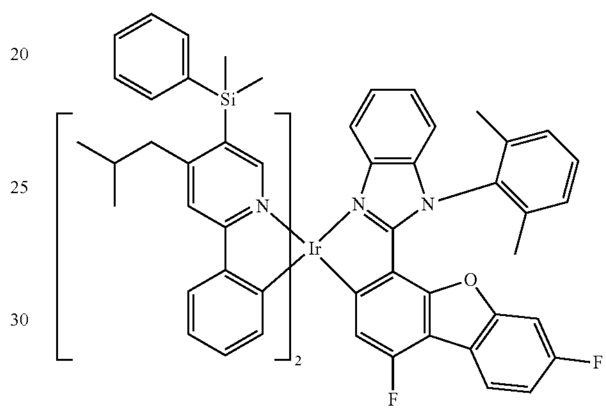
2071
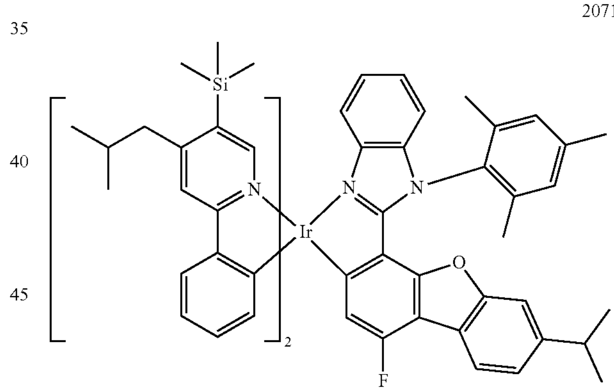
2072
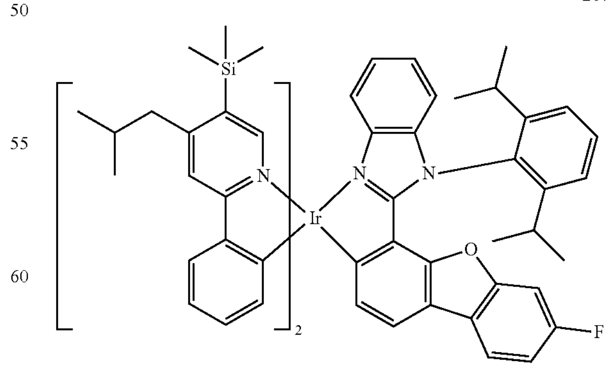

-continued
2073
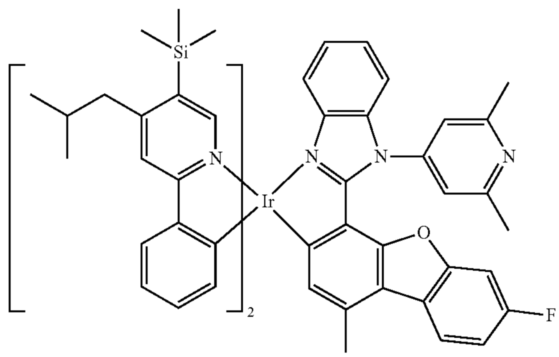
2074
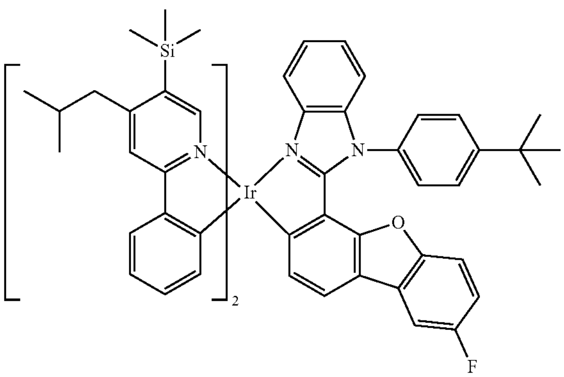
2075
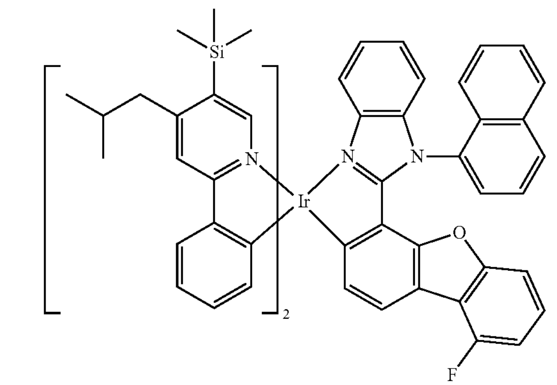
2076
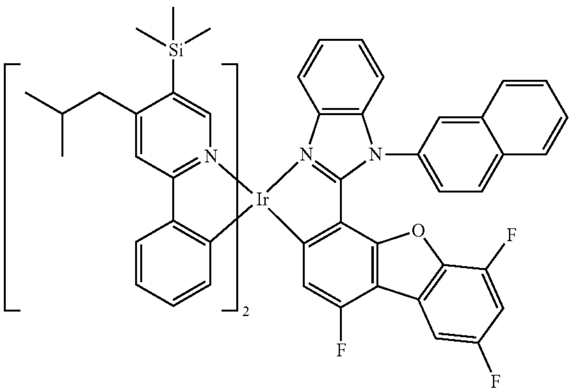
-continued
2077
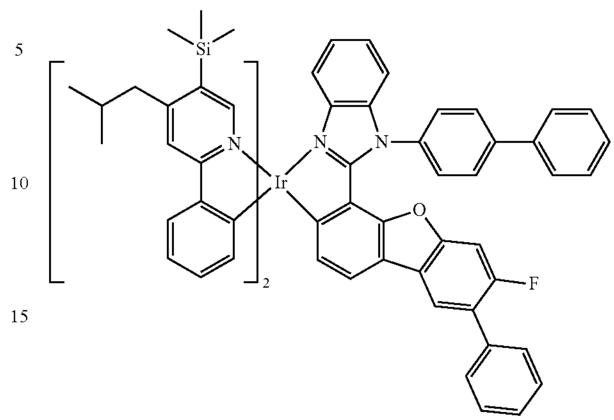
2078
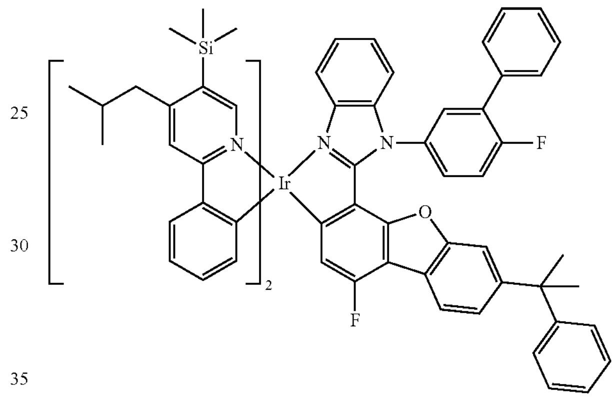
2079
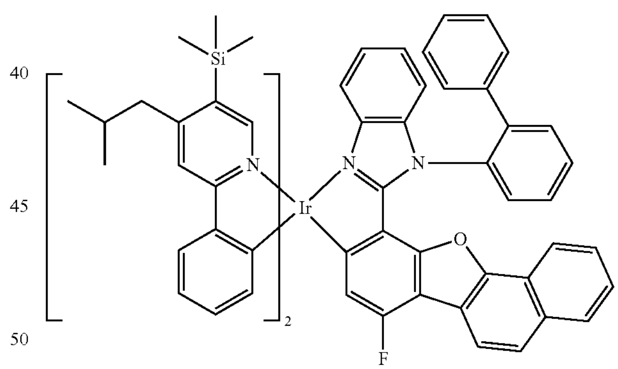
2080
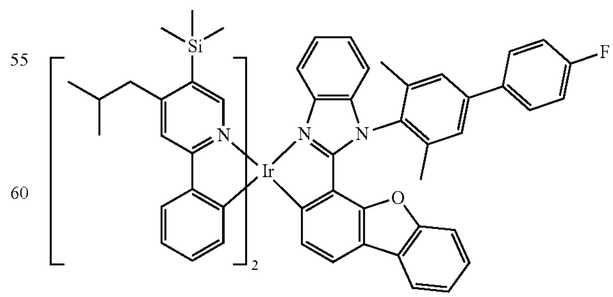

2081
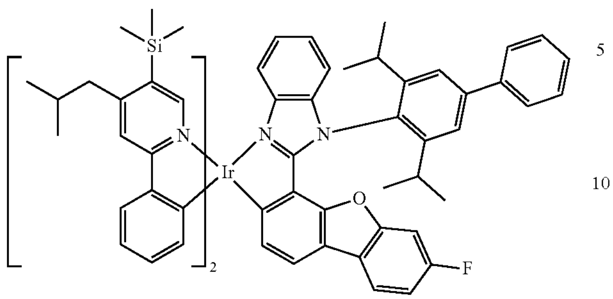
2082
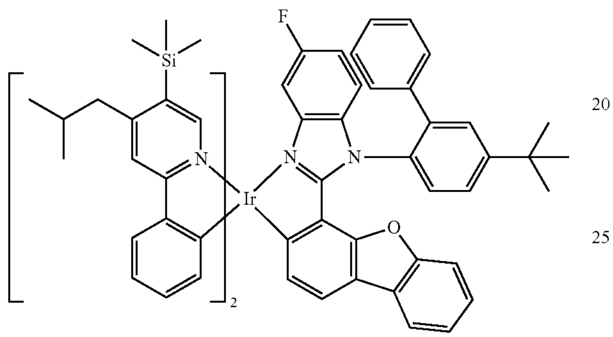
2083
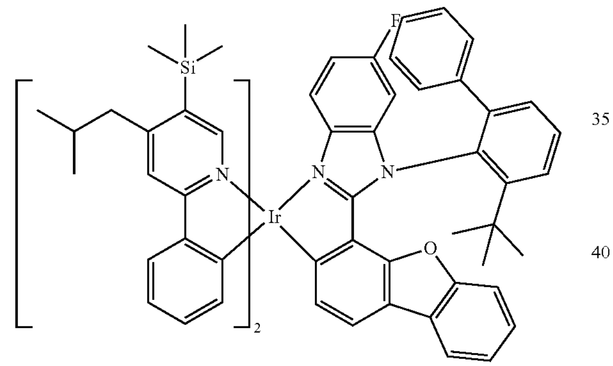
2084
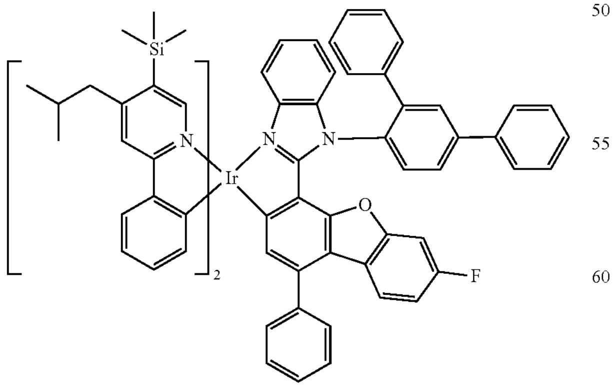
2085
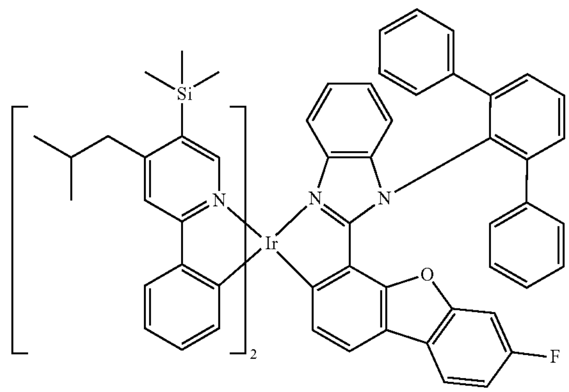
2086
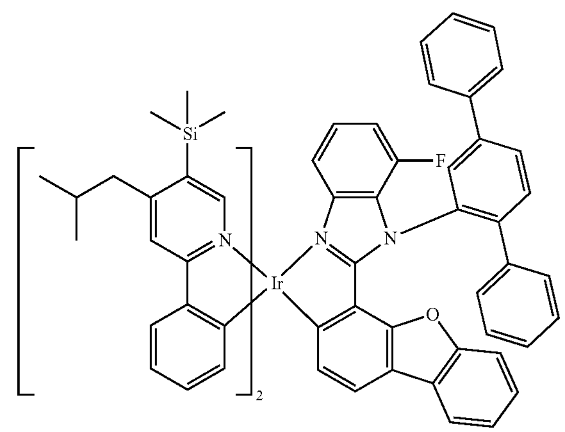
2087
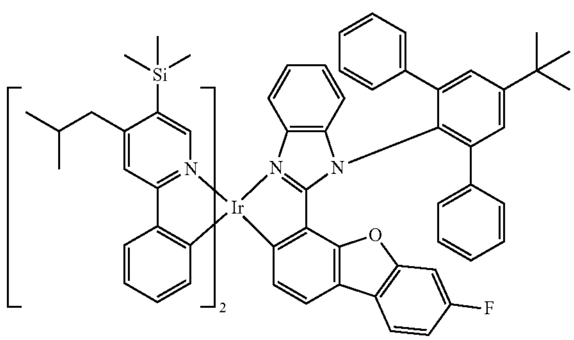
2088
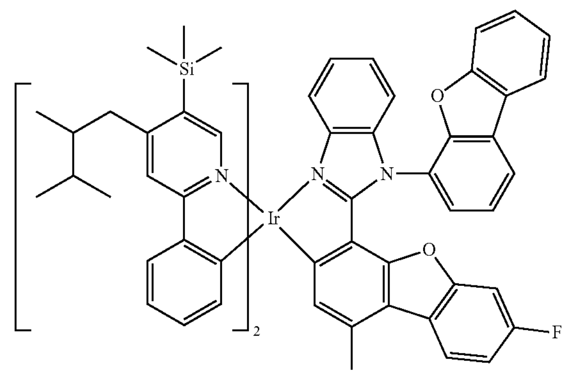

-continued
2089
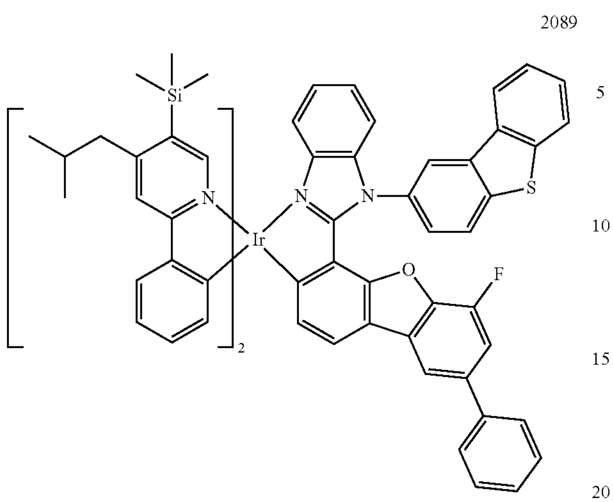
2090
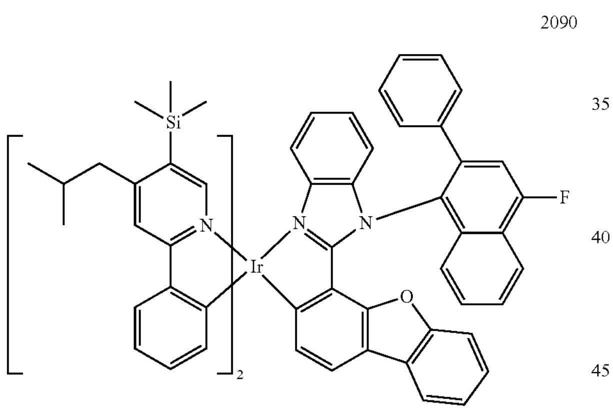
2091
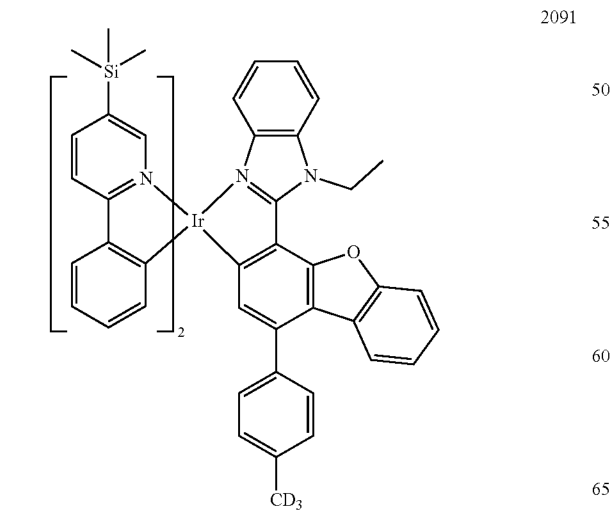
-continued
2092
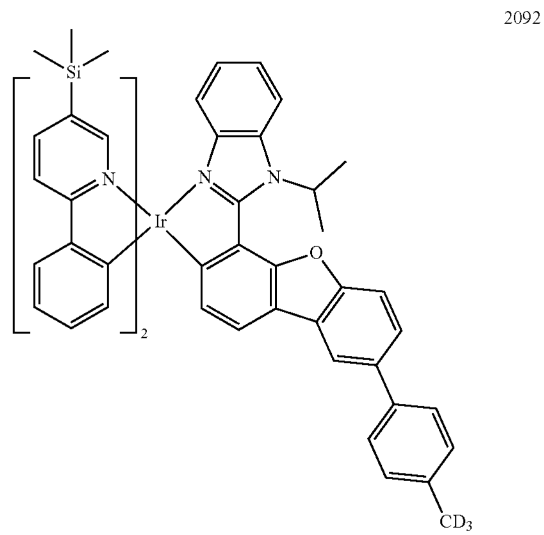
2093
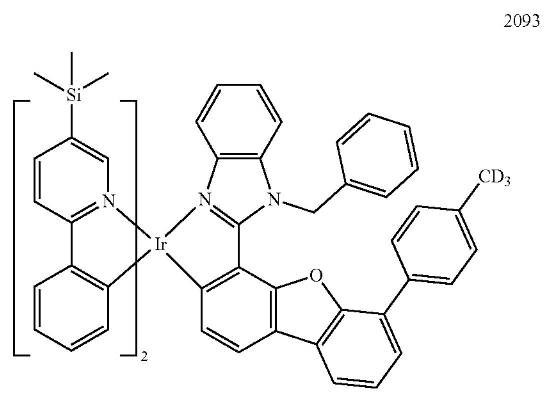
2094
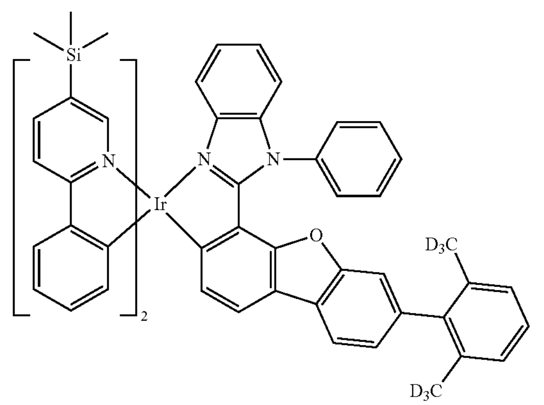

2095
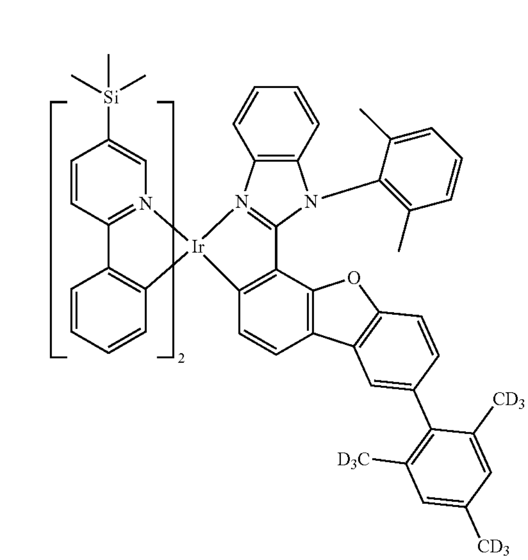
2096
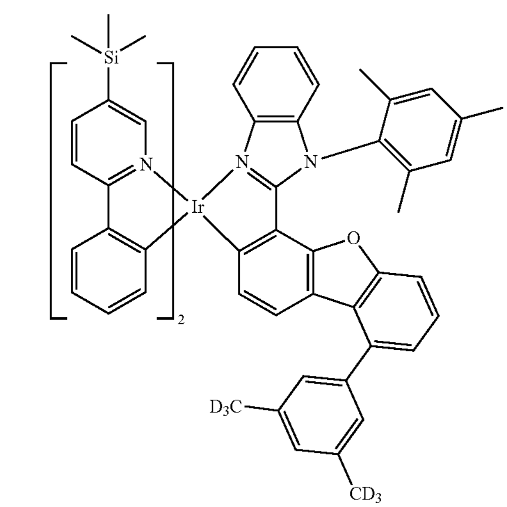
2097
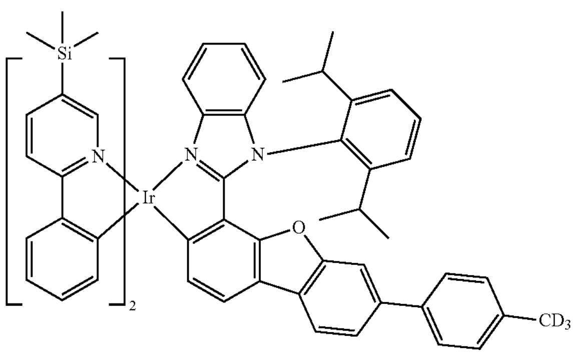
2098
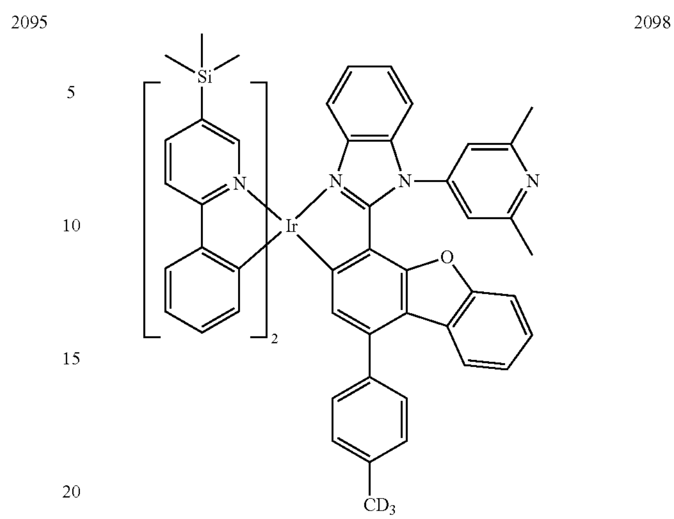
2099
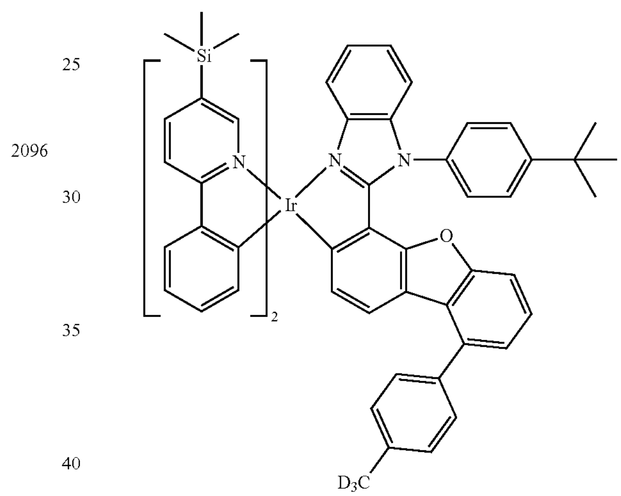
2100
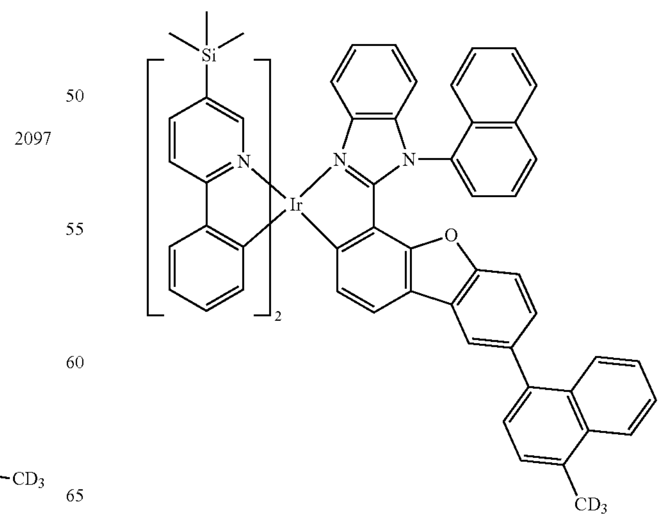

-continued
2101
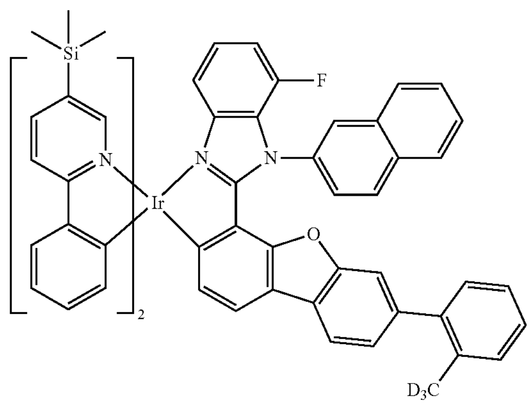
2102
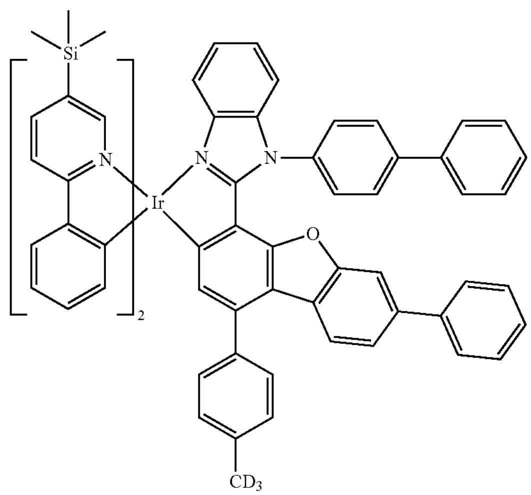
2103
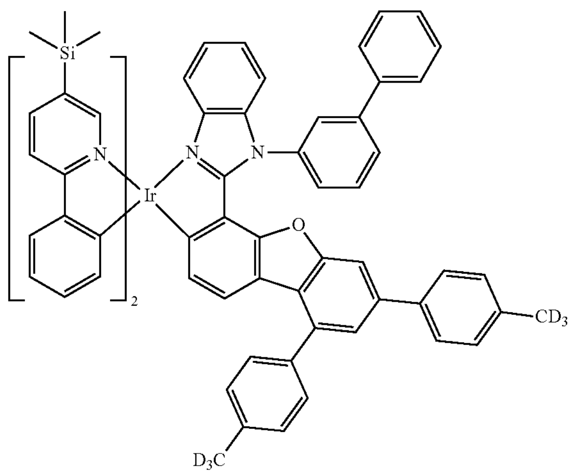
-continued
2104
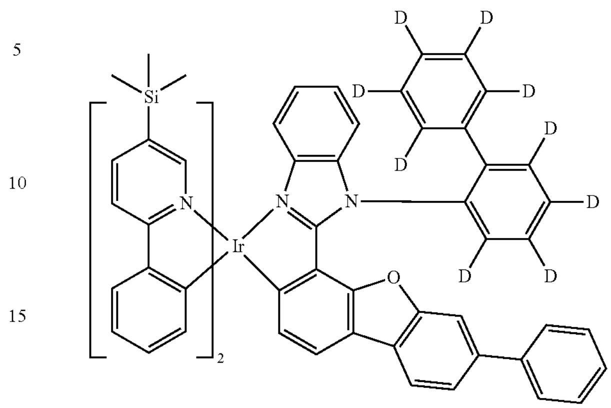
2105
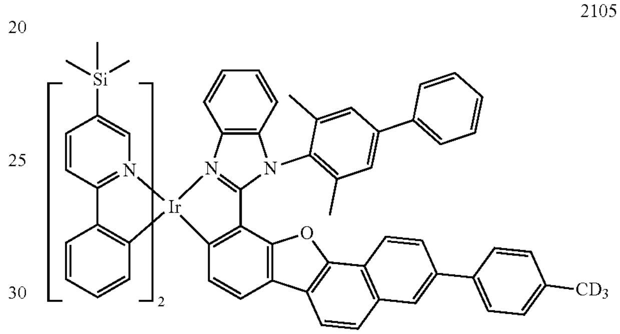
2106
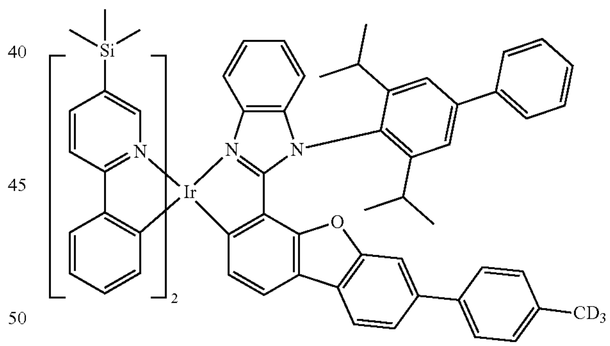
2107
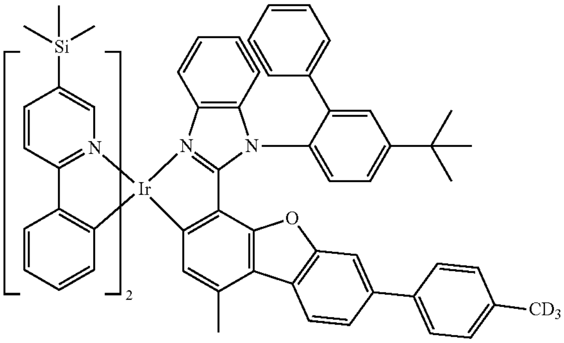

-continued
2108
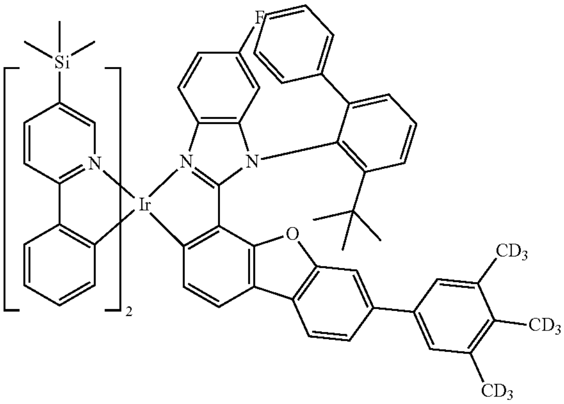
2109
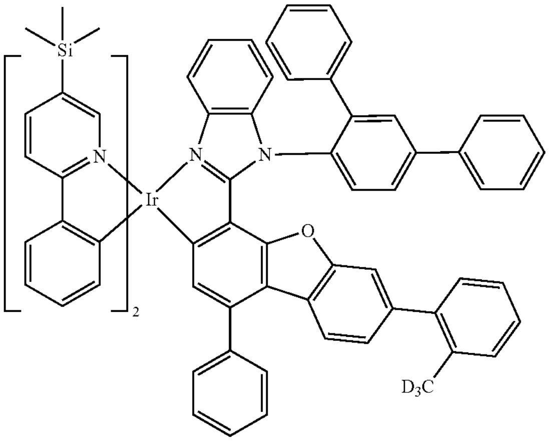
2110
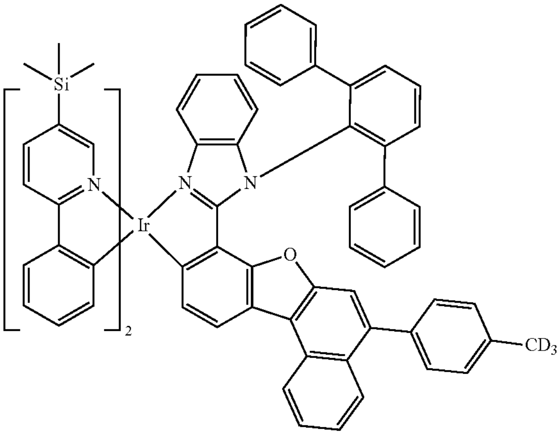
-continued
2111
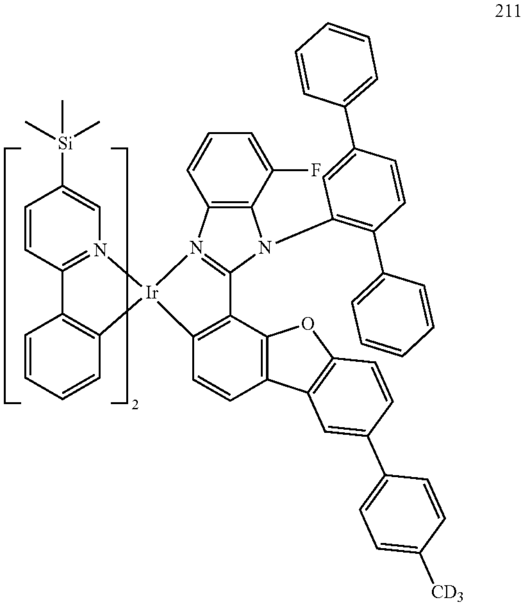
2112
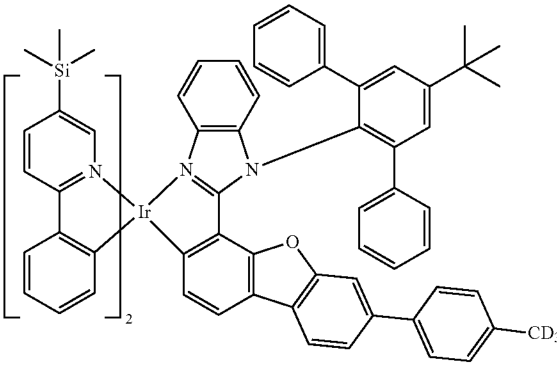
2113
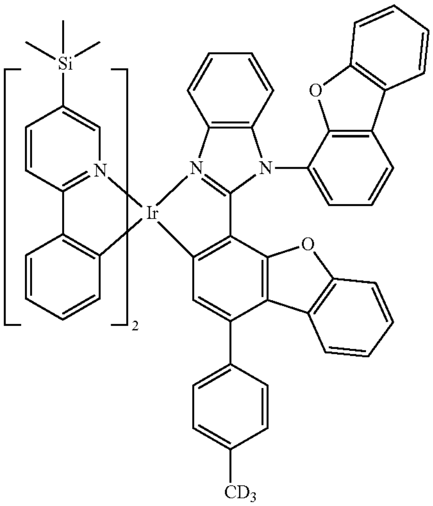

-continued
2114
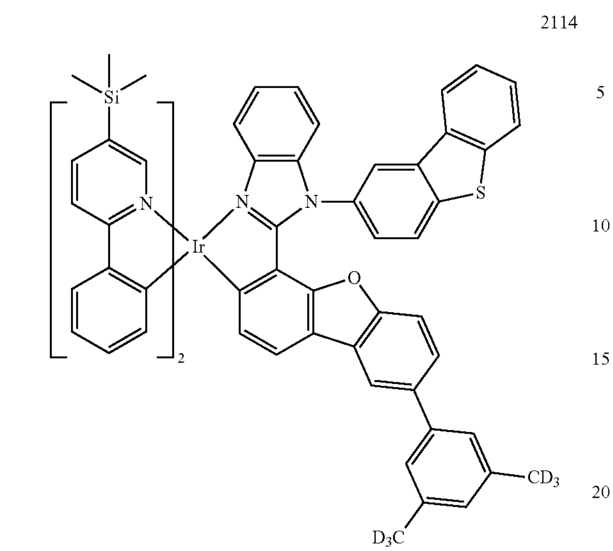
2115
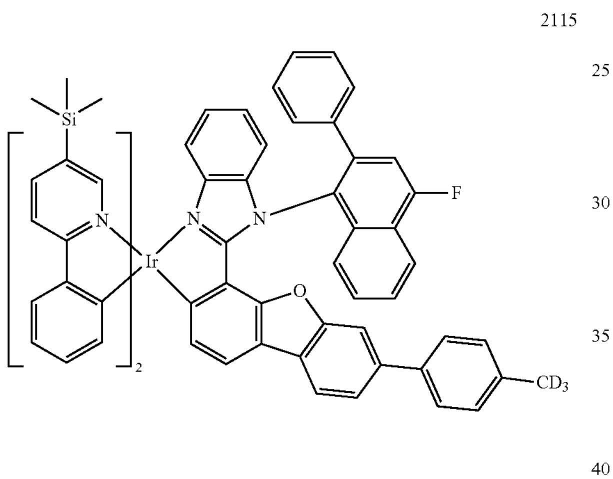
2116
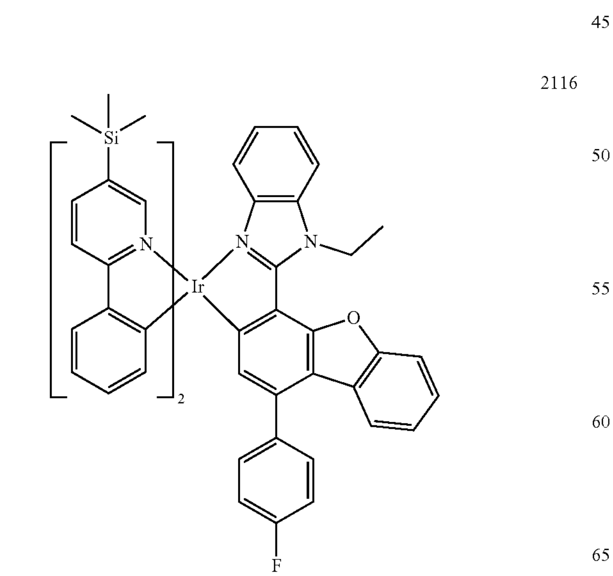
-continued
2117
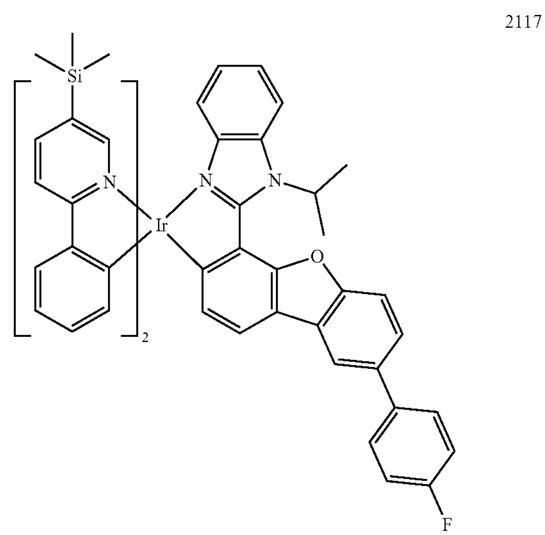
2118
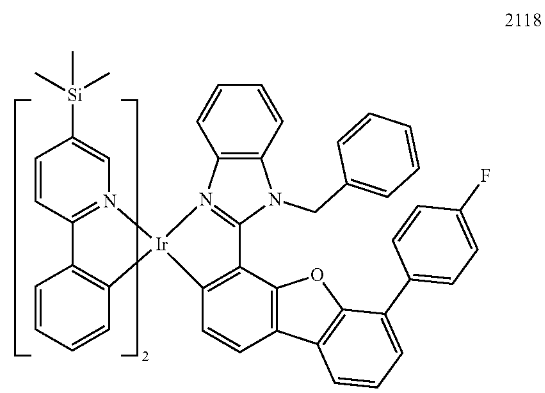
2119
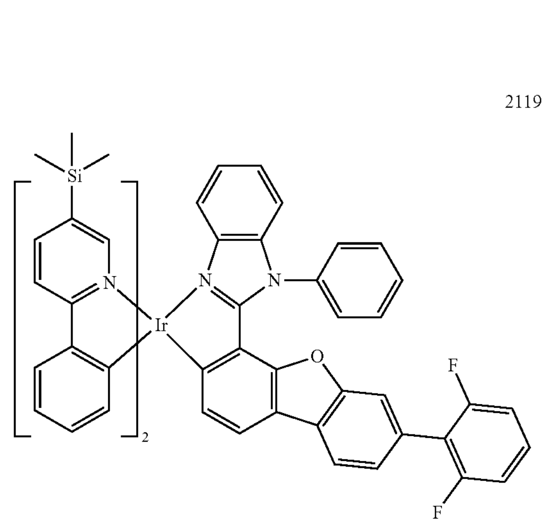

2120
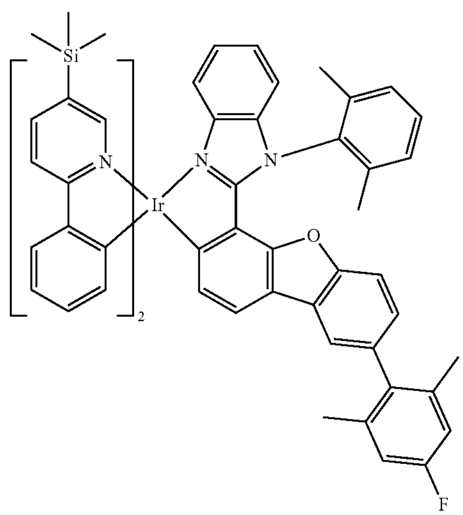
2121
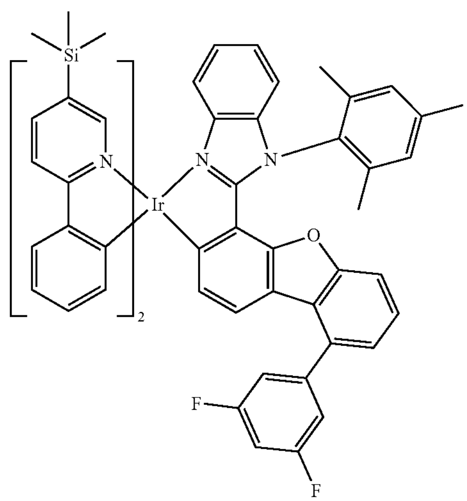
2122
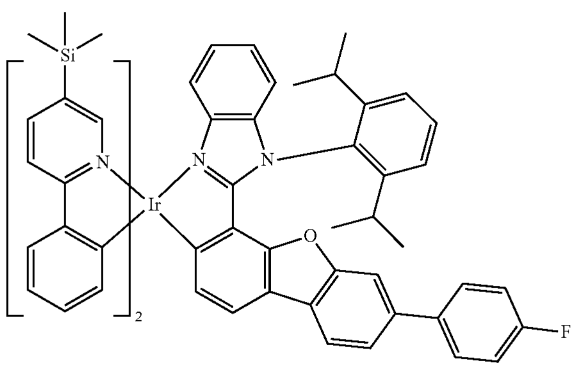
2123
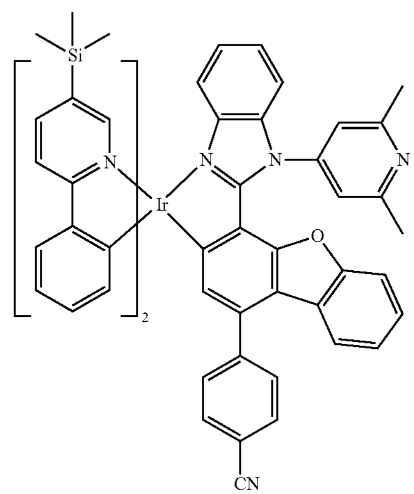
2124
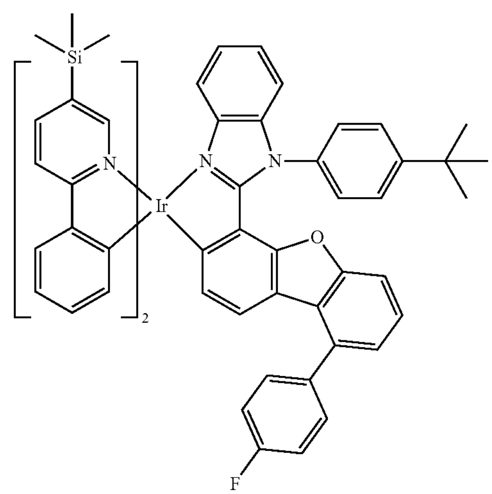
2125
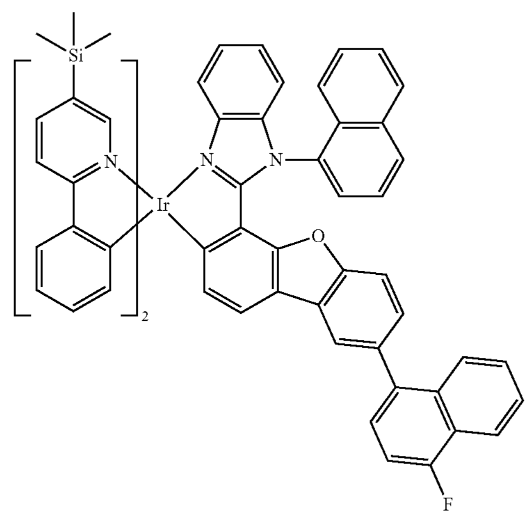

2126
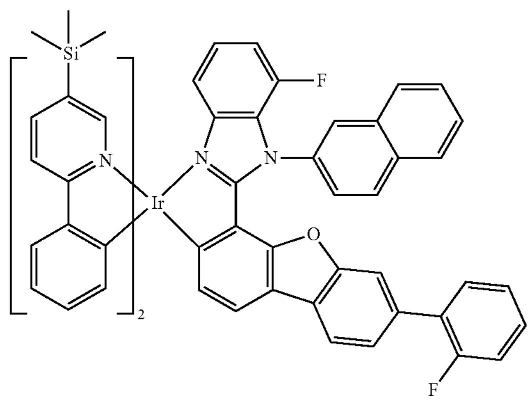
2127
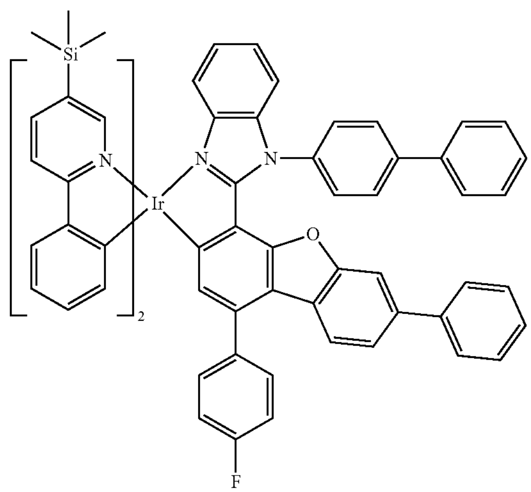
2128
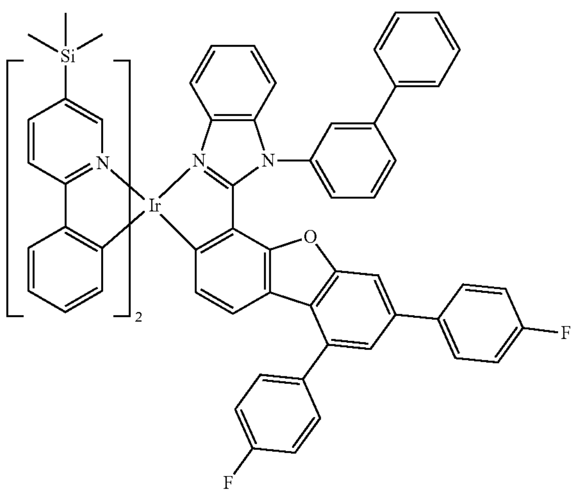
2129
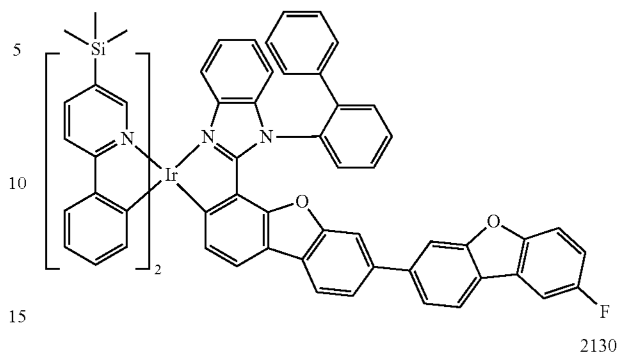
2130
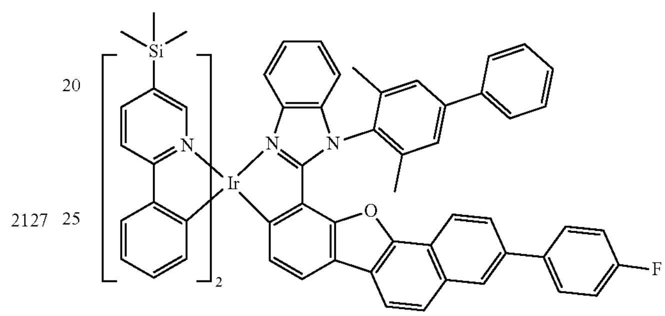
2131
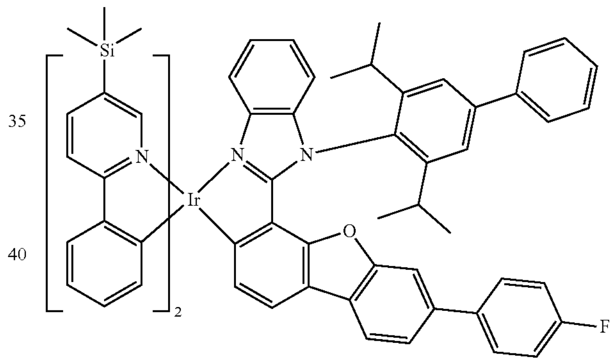
2132
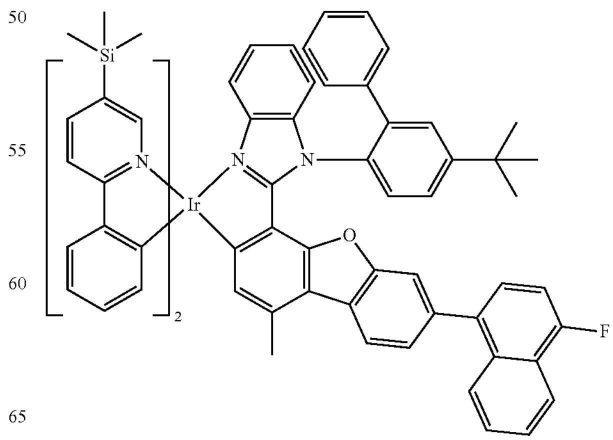

-continued
2133
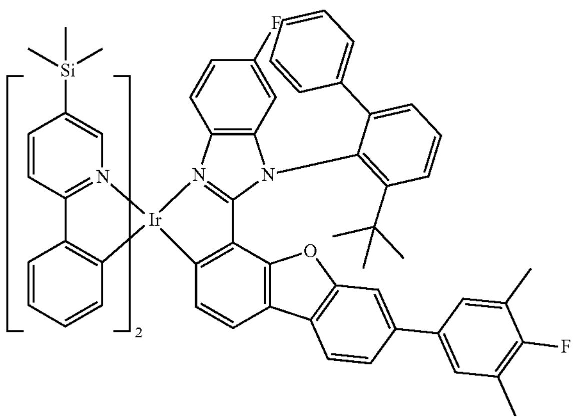
2134
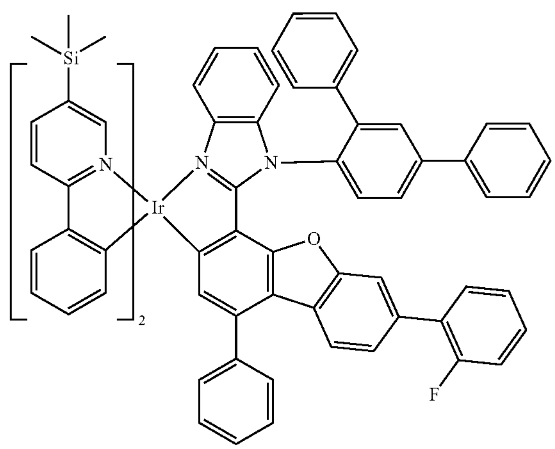
2135
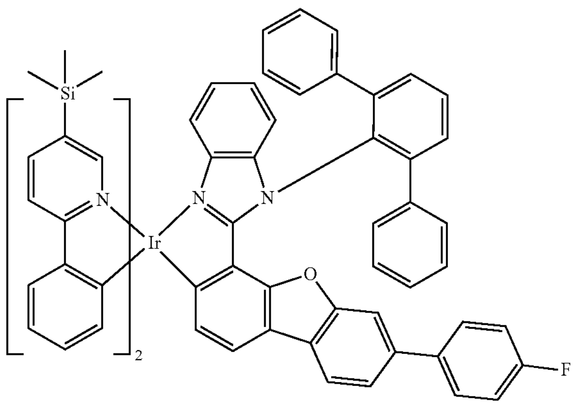
-continued
2136
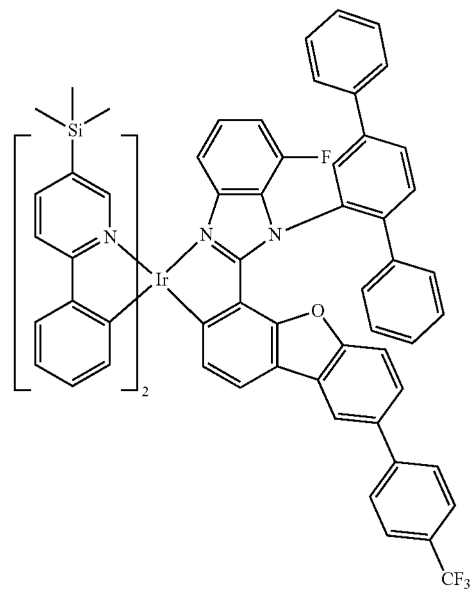
2137
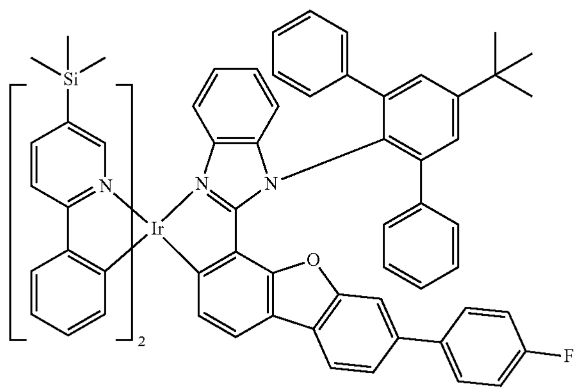
2138
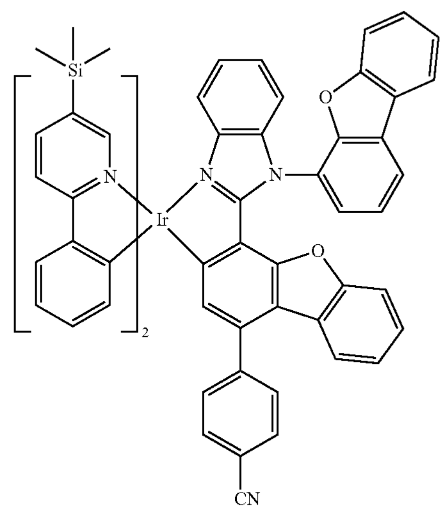

-continued
2139
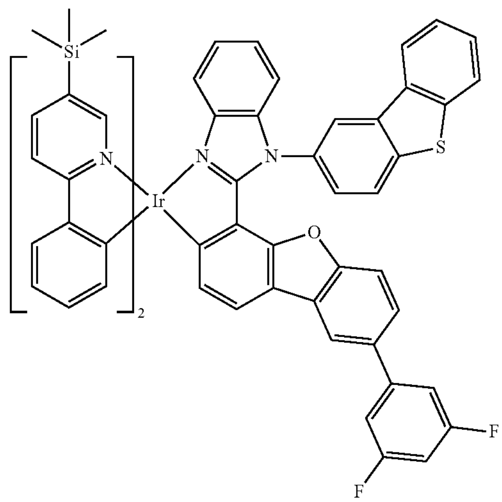
2140
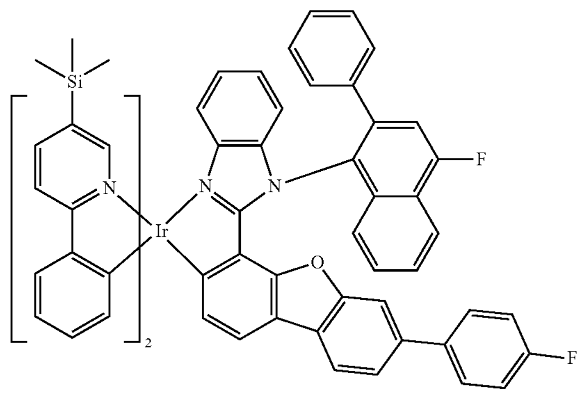
2141
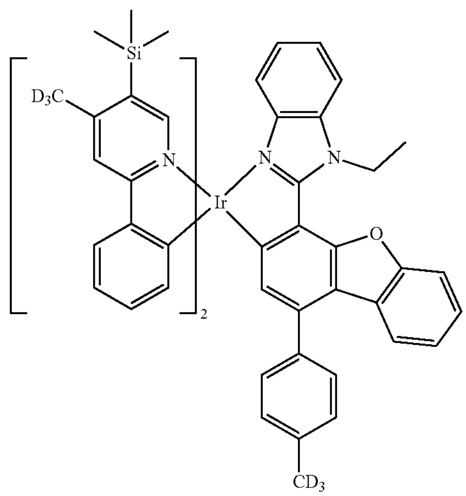
-continued
2142
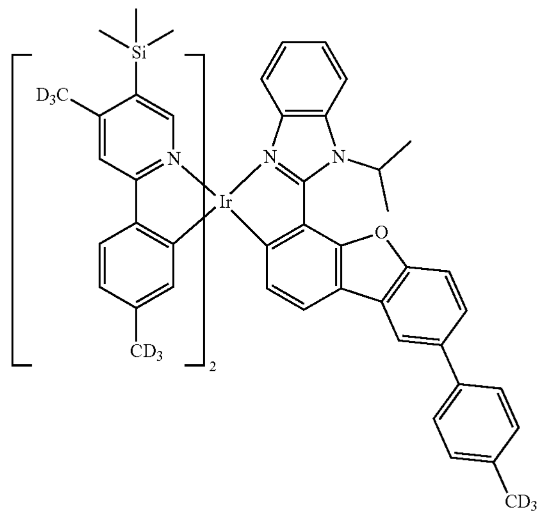
2143
2144
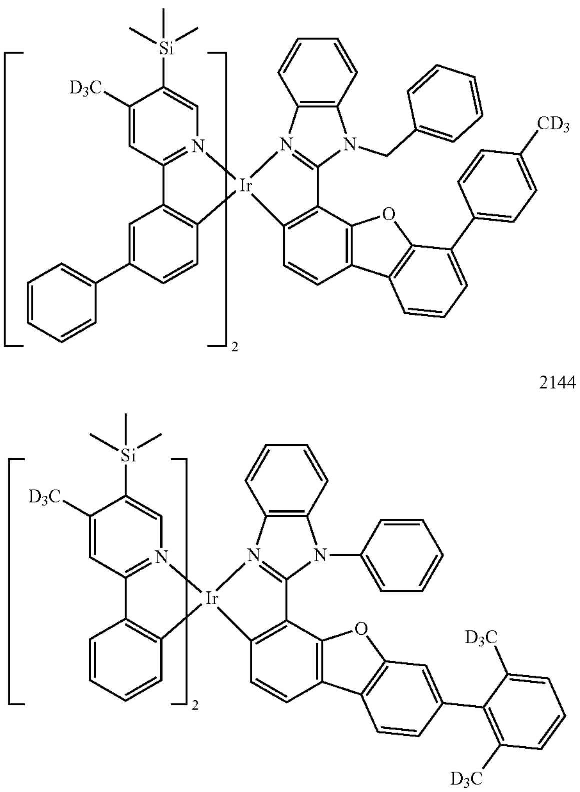

2145
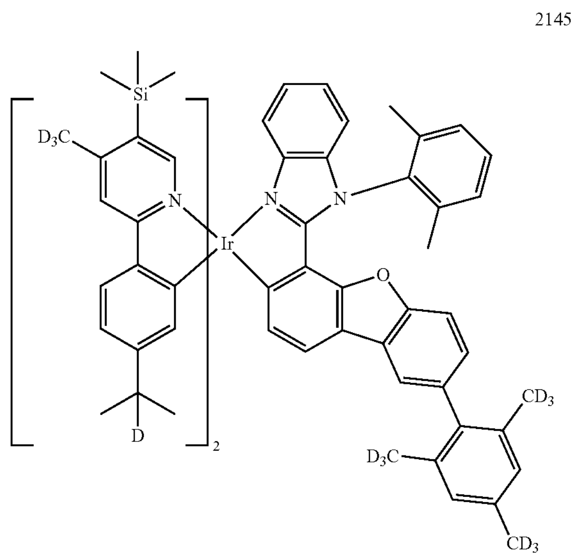
2146
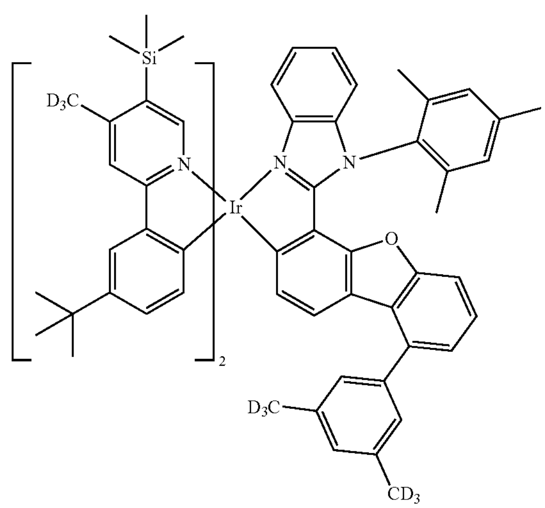
2147
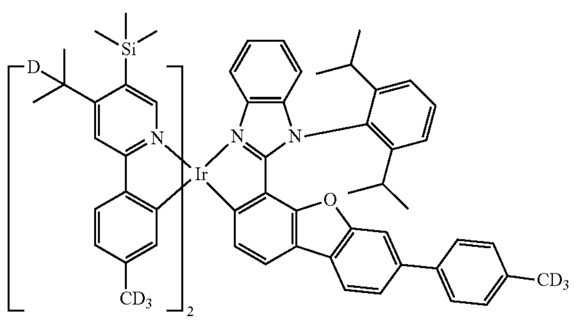
2148
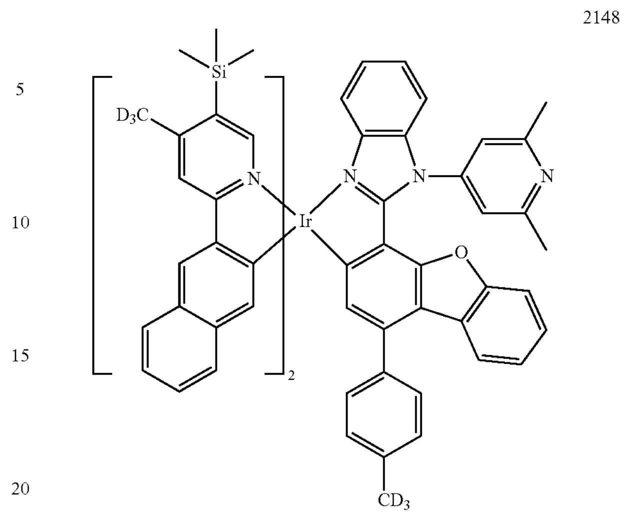
2149
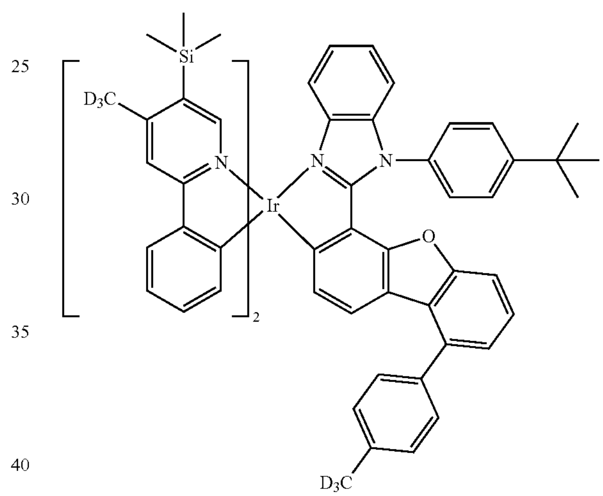
2150
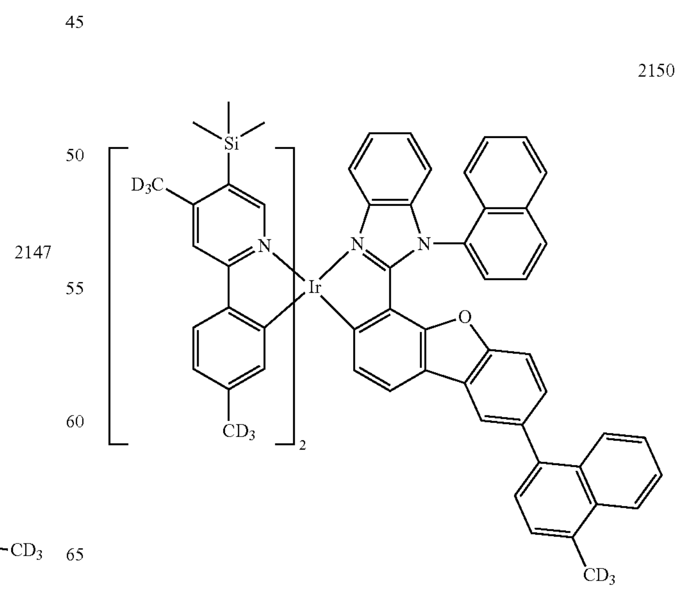

2151
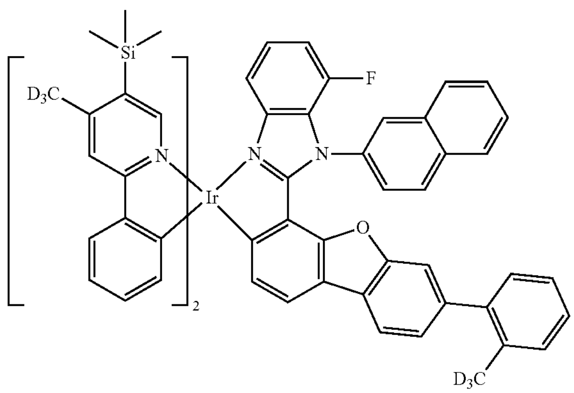
2152
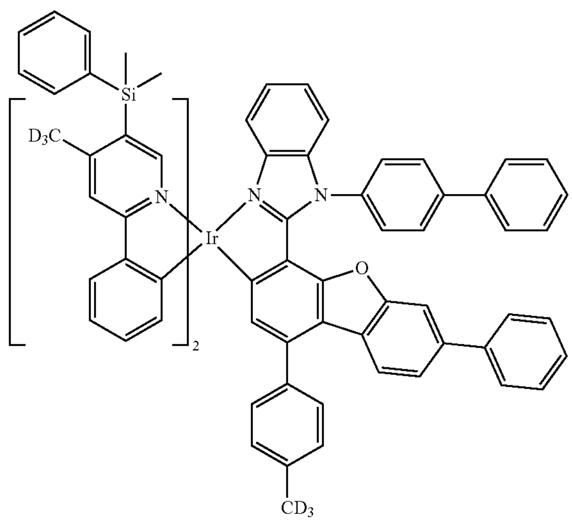
2153
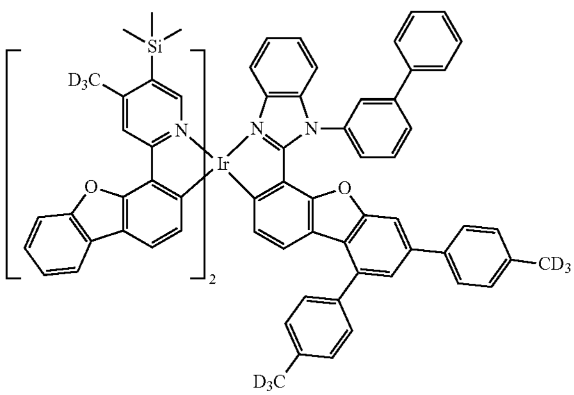
2154
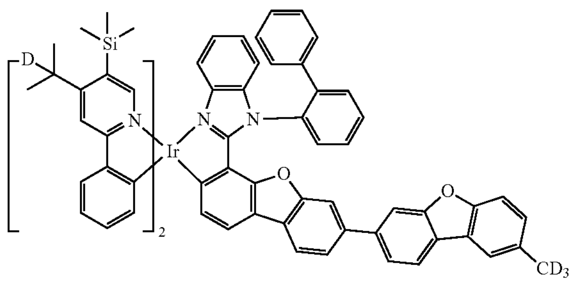
2155
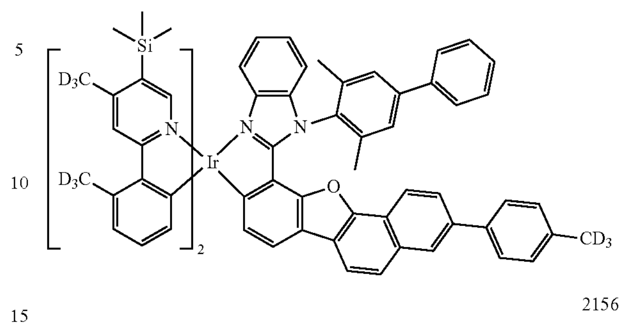
2156
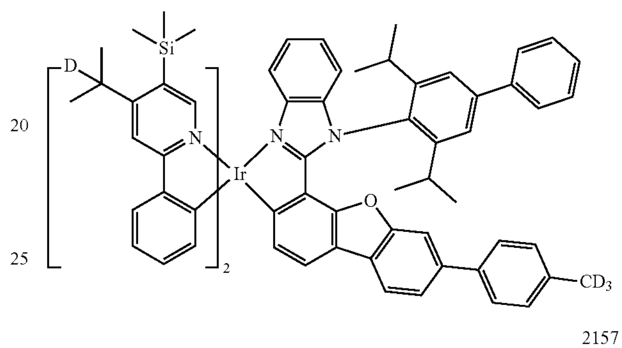
2157
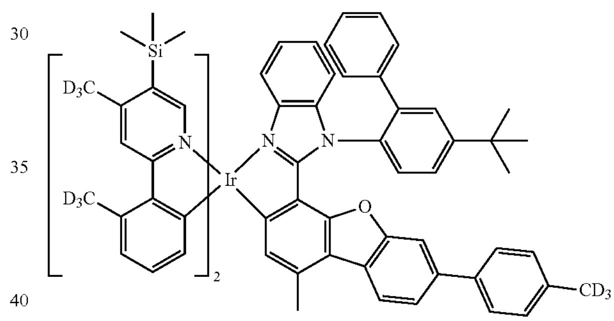
2158
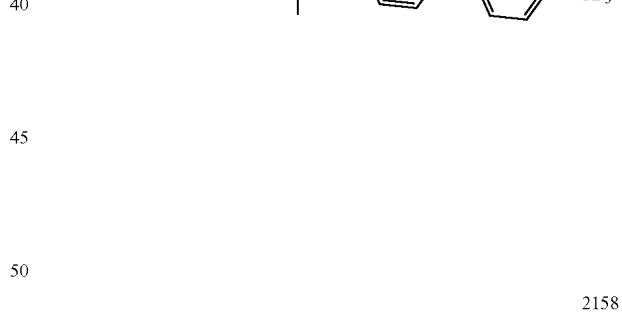
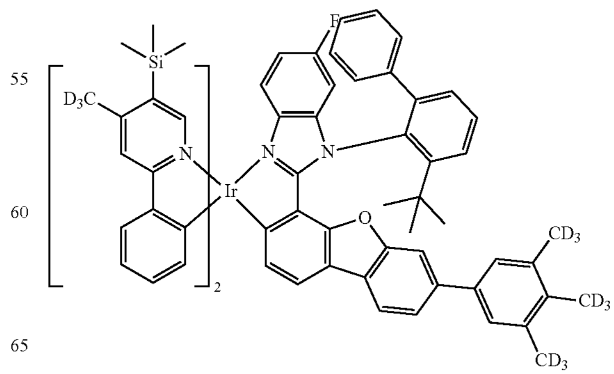

-continued
2159
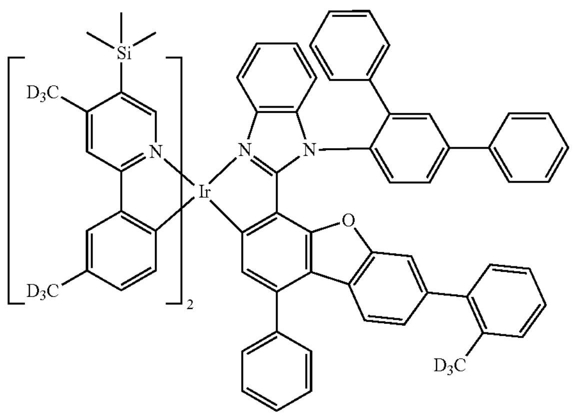
2160
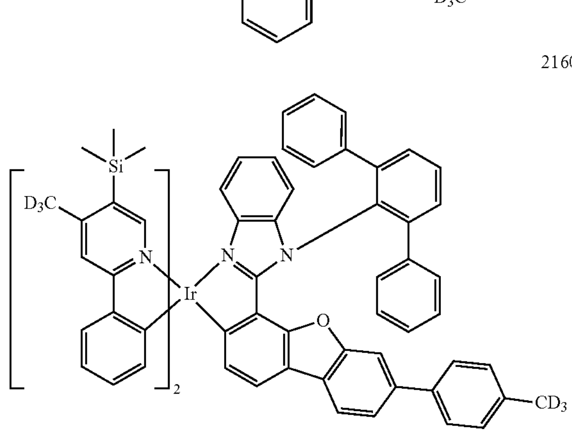
2161
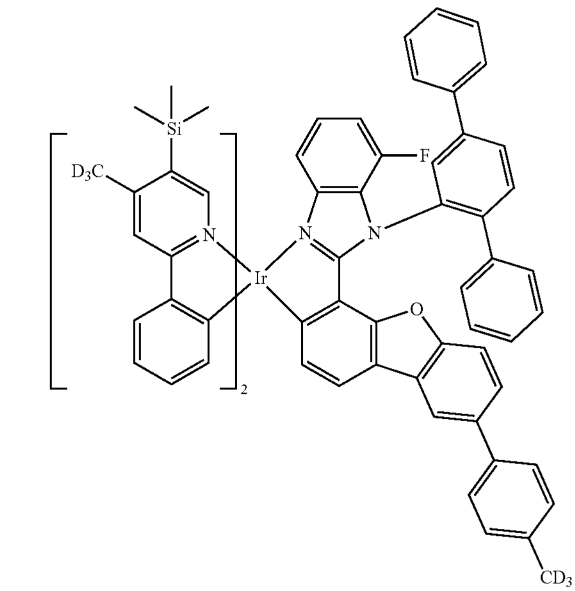
-continued
2162
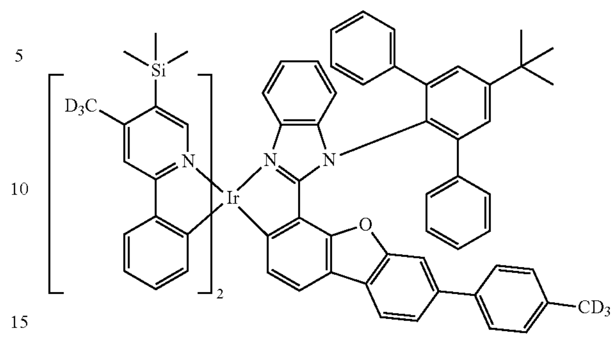
2163
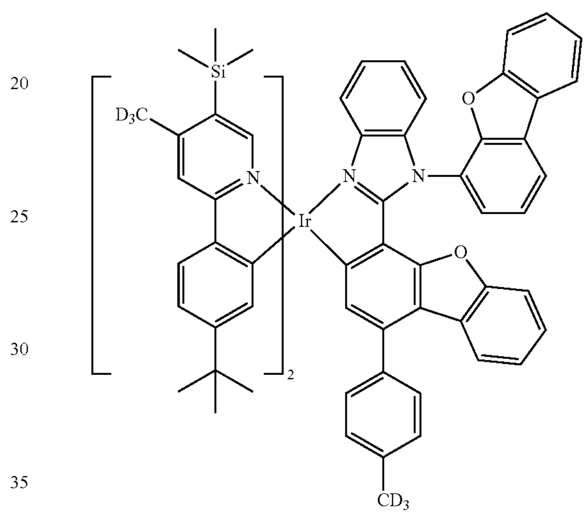
2164
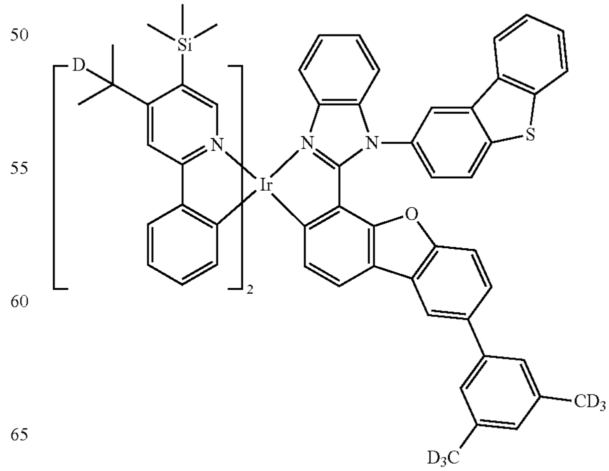

-continued
2165
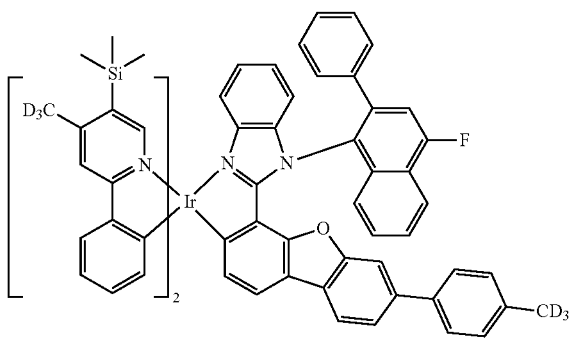
2166
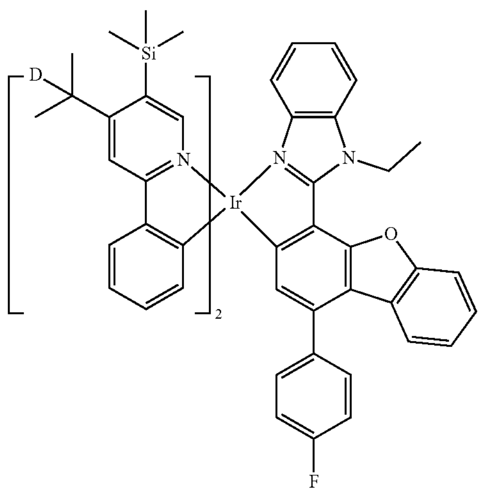
2167
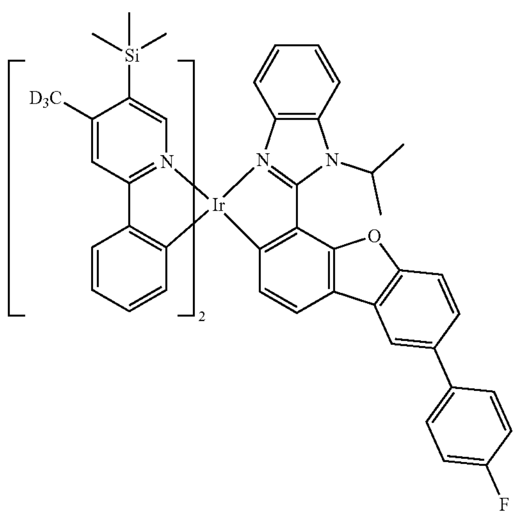
-continued
2168
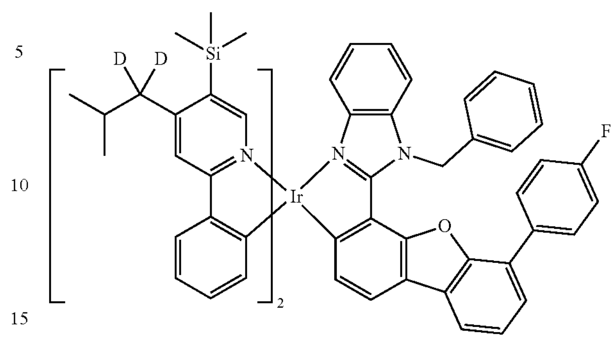
2169
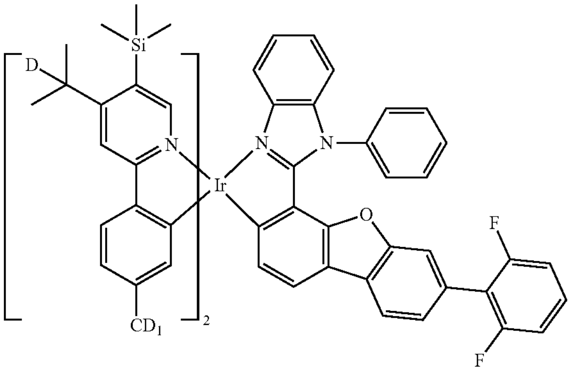
2170
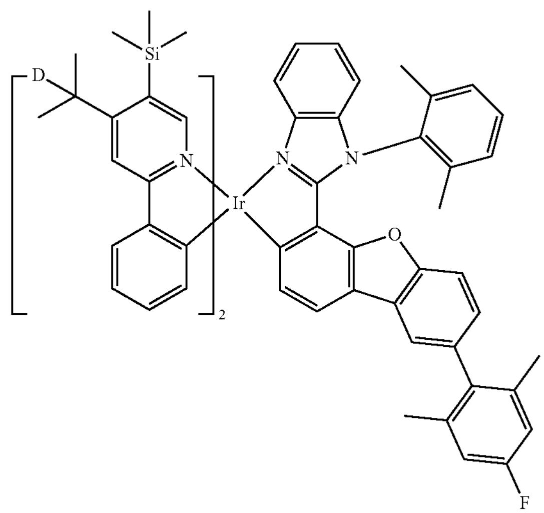

2171
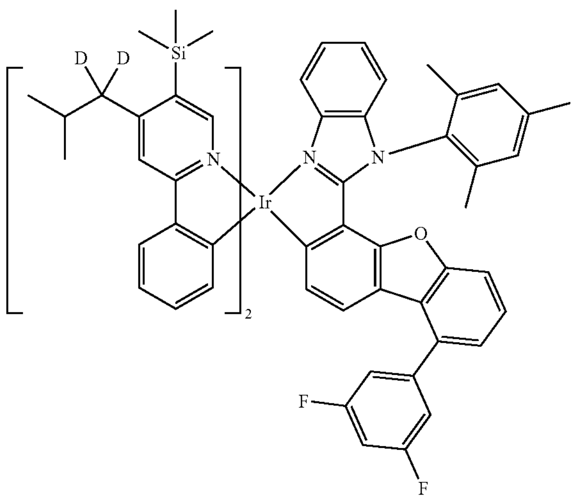
2172
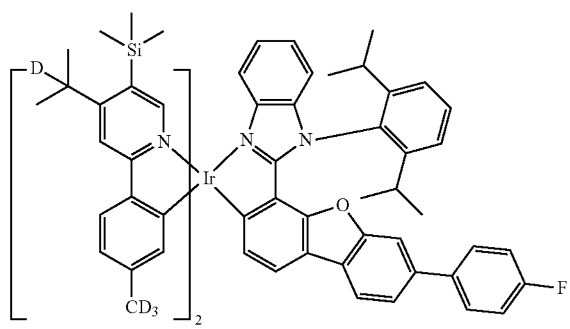
2173
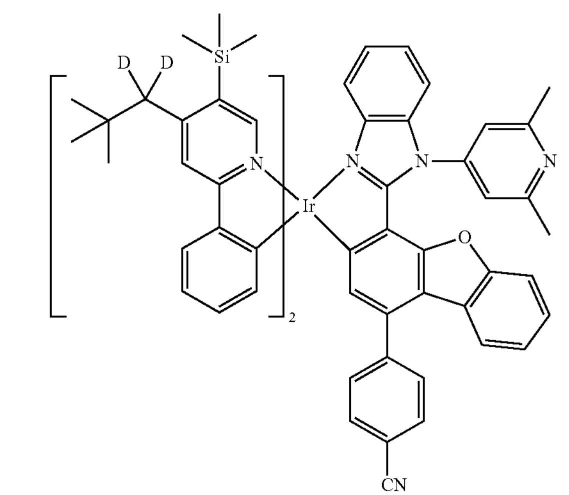
2174
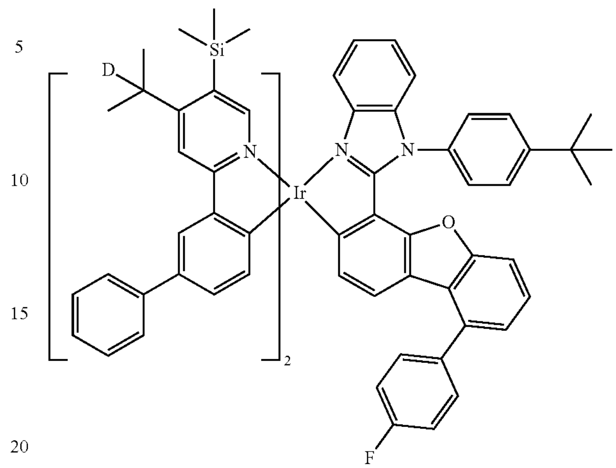
2175
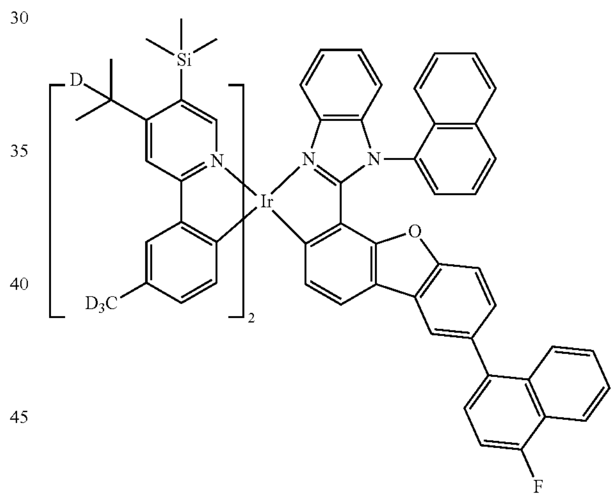
2176
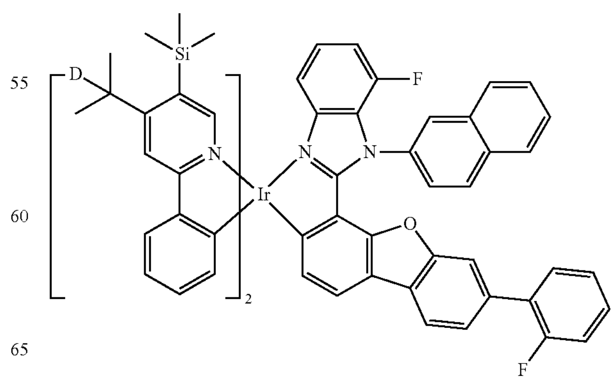

-continued
2177
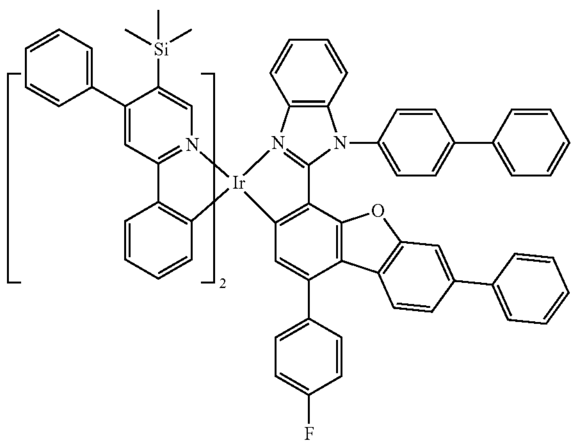
2178
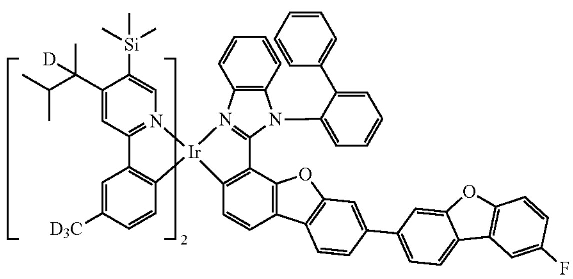
2179
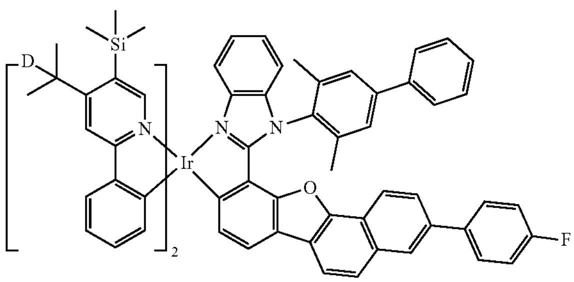
2180
-continued
2181
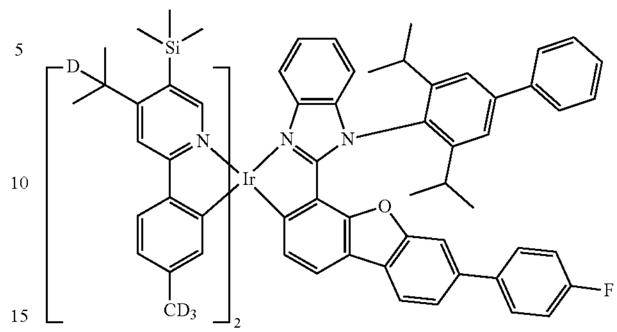
2182
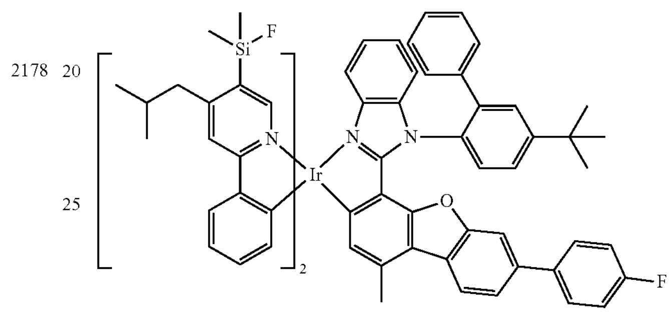
2183
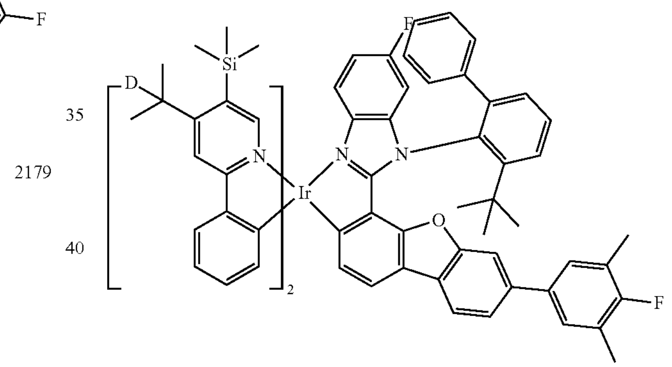
2184
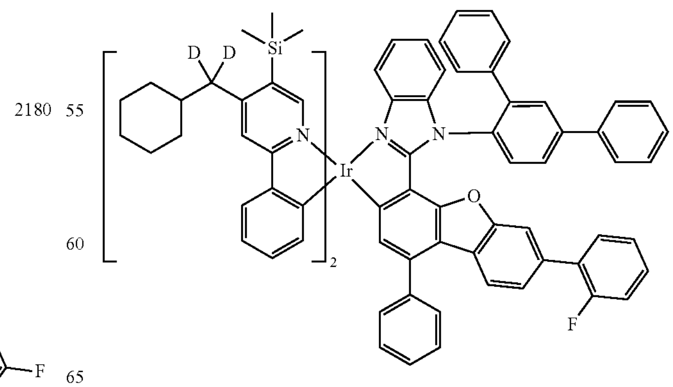

-continued
2185
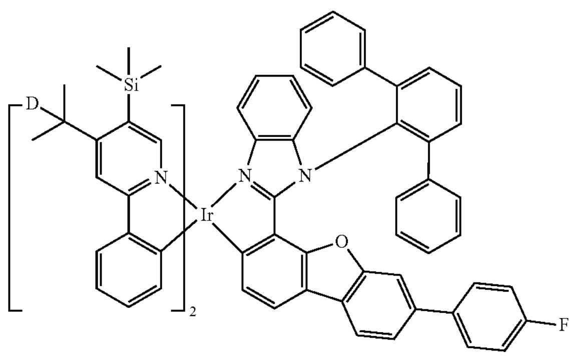
2186
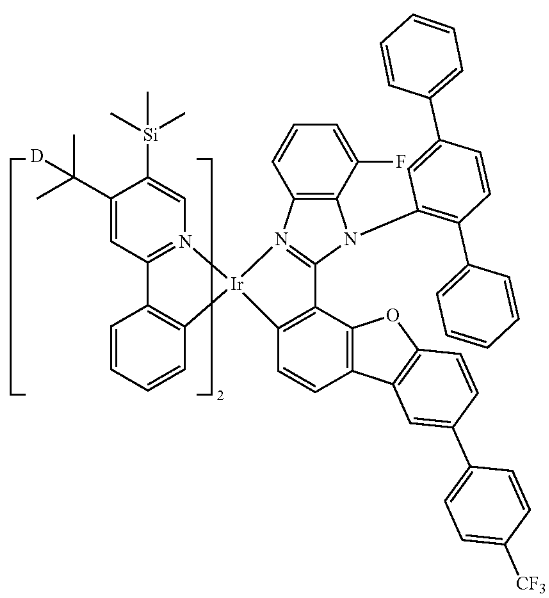
2187
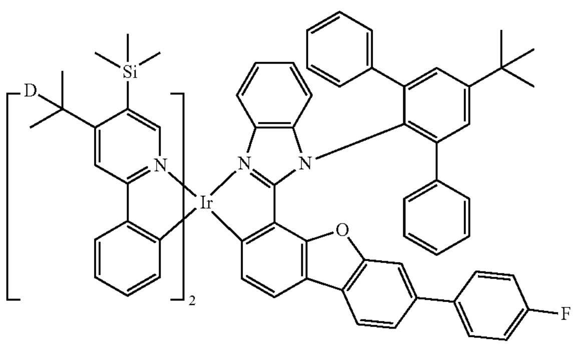
-continued
2188
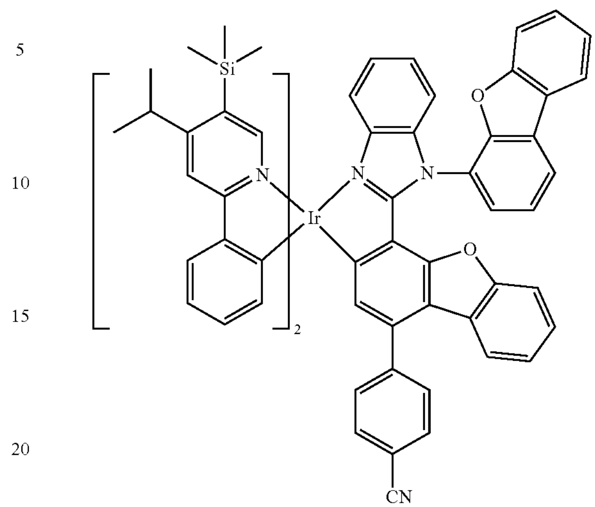
2189
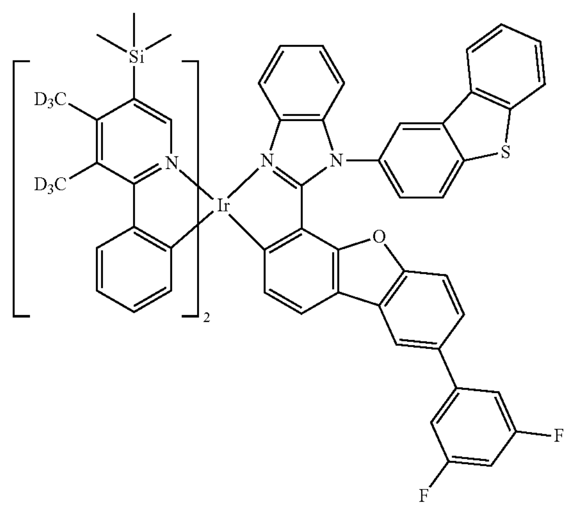
2190
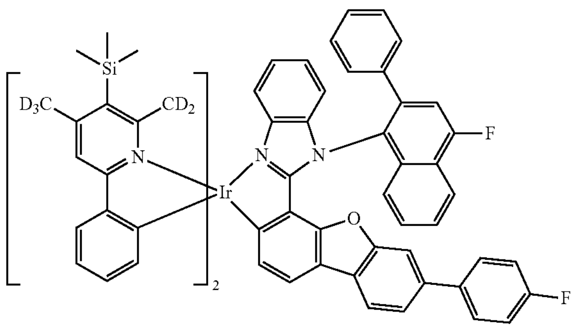

-continued
2191
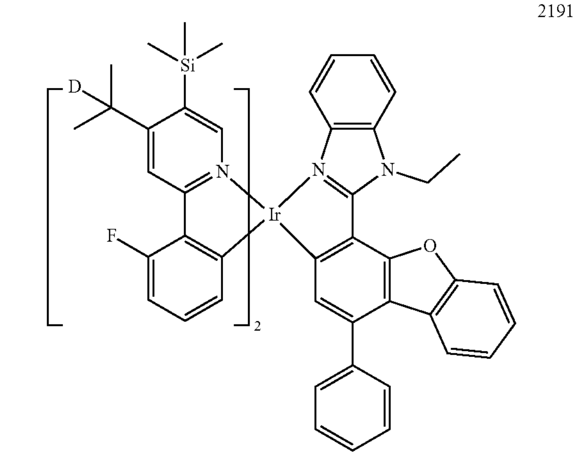
2192
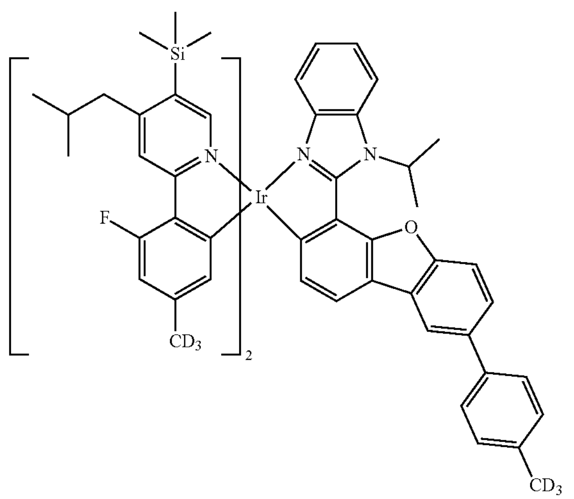
2193
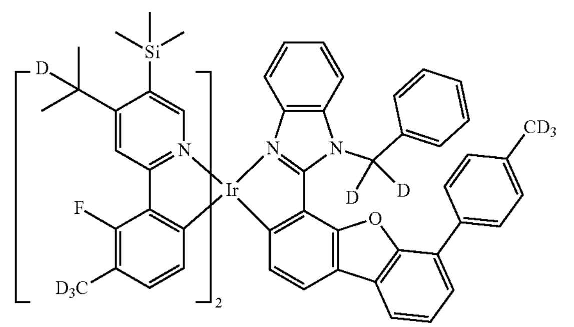
-continued
2194
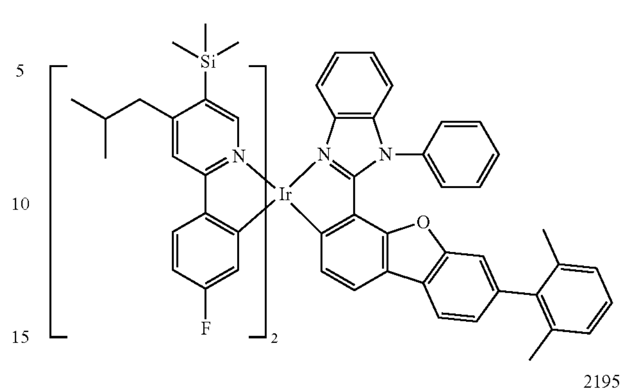
2195
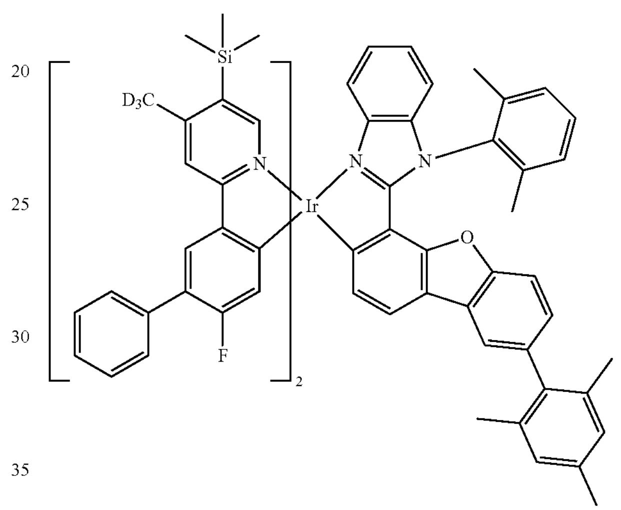
2196
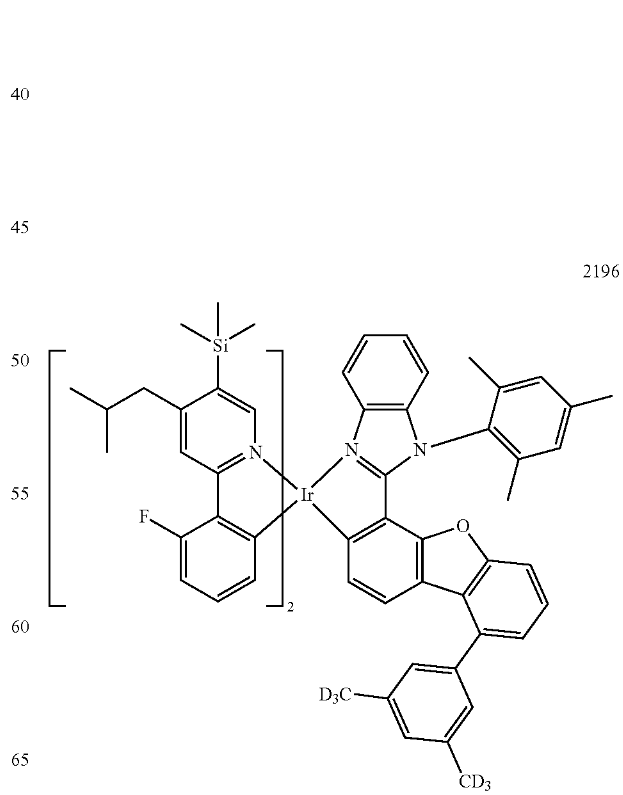

2197
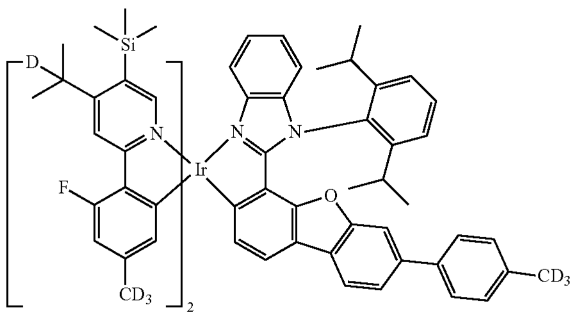
2198
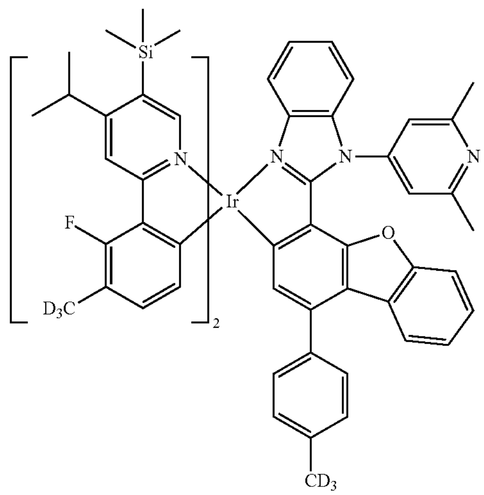
2199
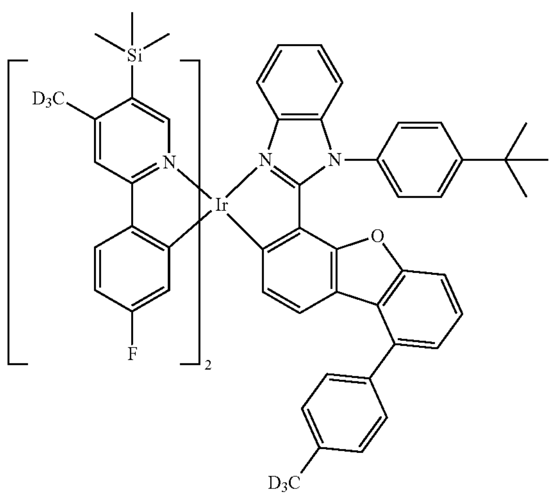
2200
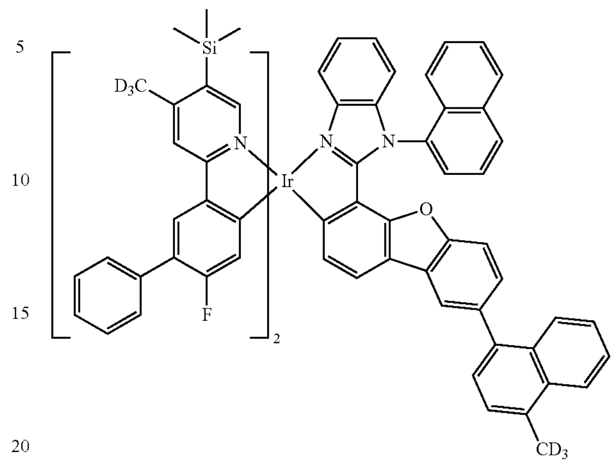
2201
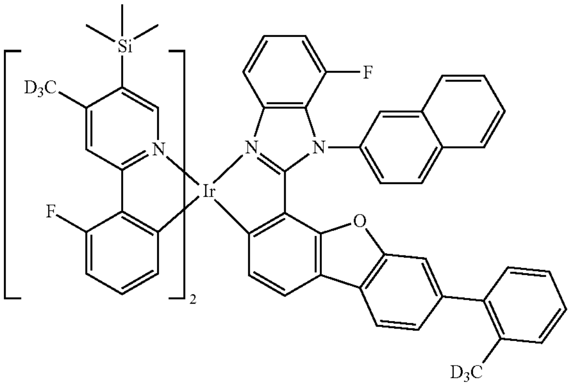
2202
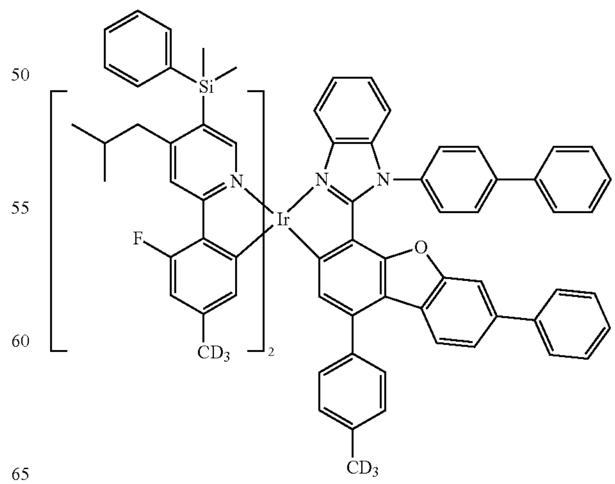

-continued
2203
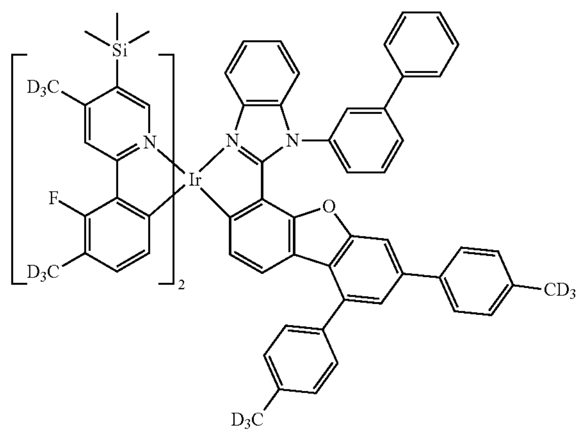
2204
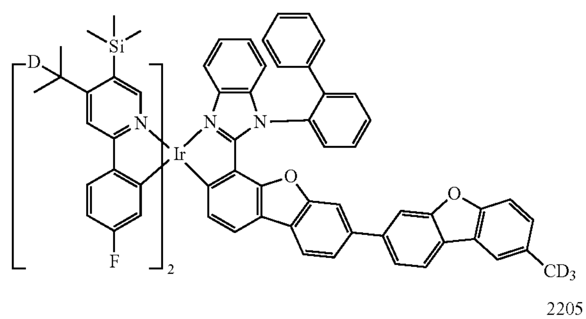
2205
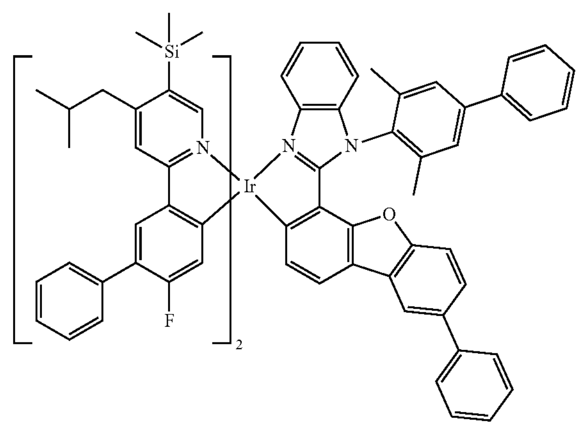
2206
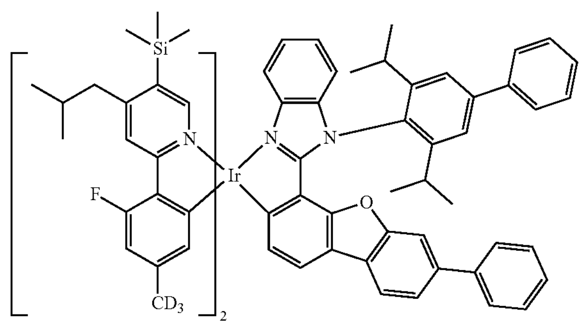
-continued
2207
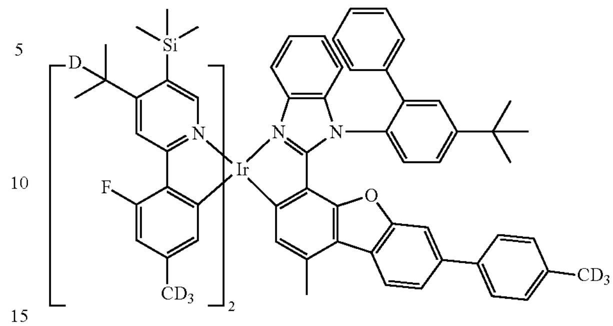
2208
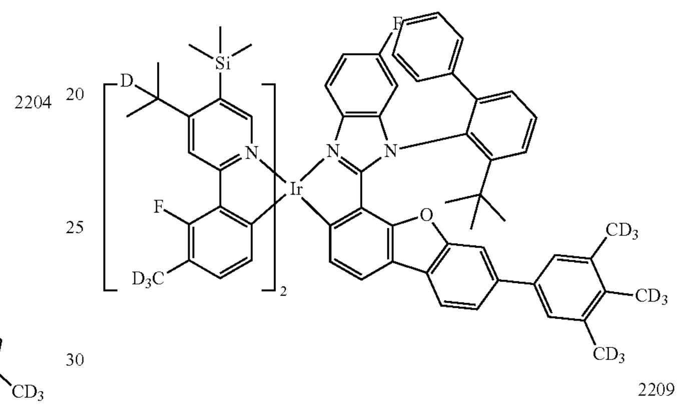
2209
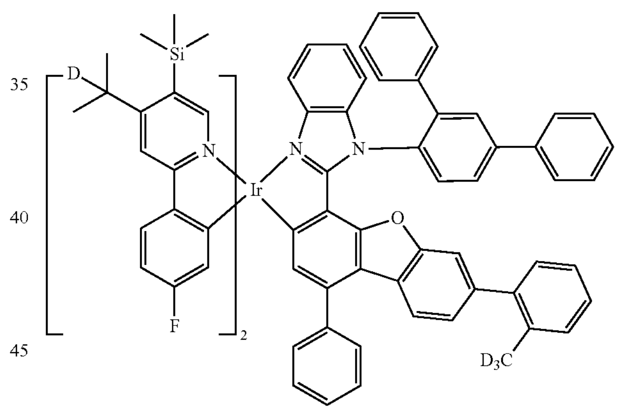
2210
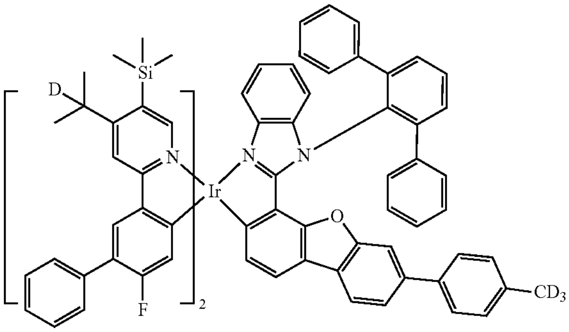

-continued
2211
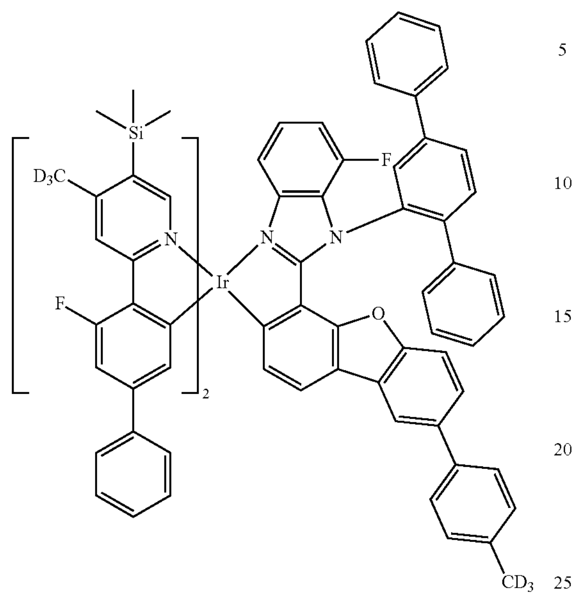
2212
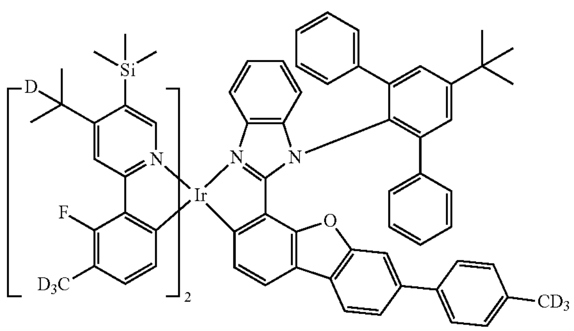
2213
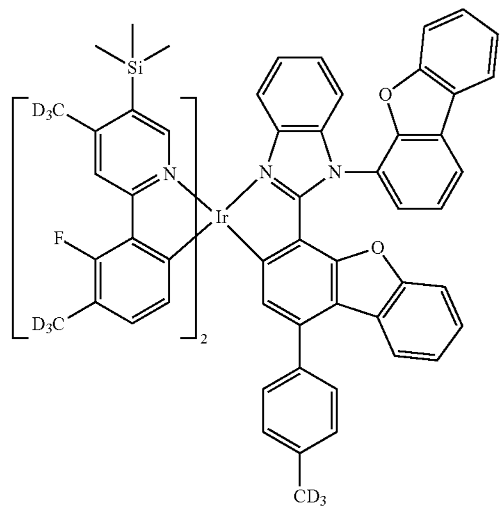
-continued
2214
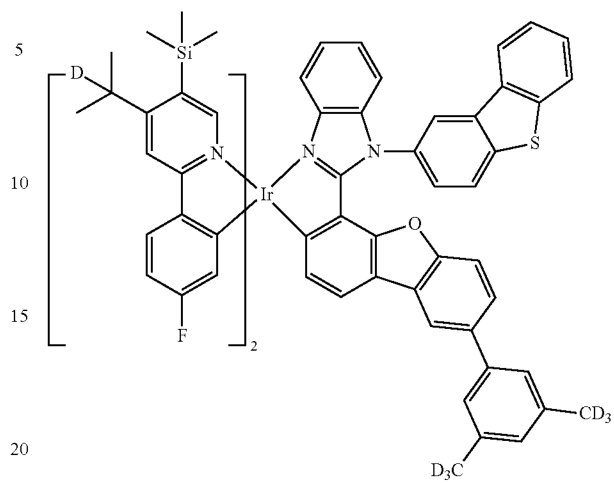
2215
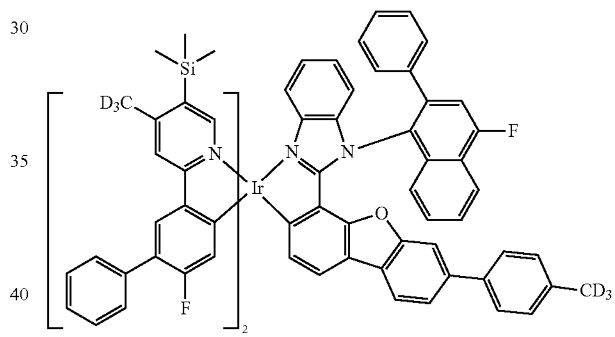
2216
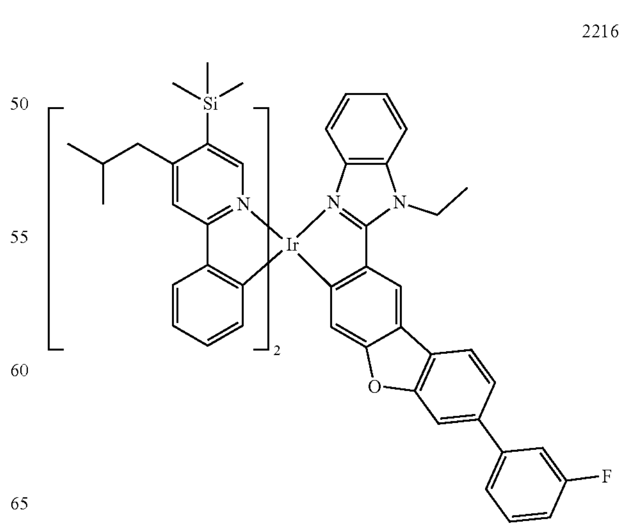

-continued
2217
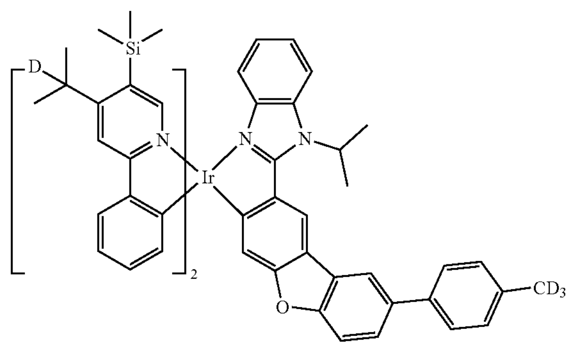
2218
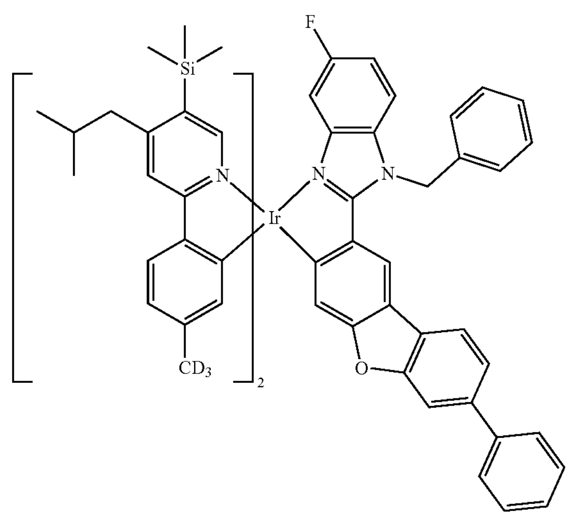
2219
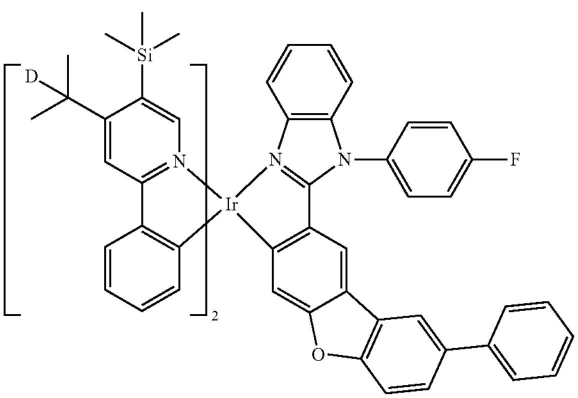
-continued
2220
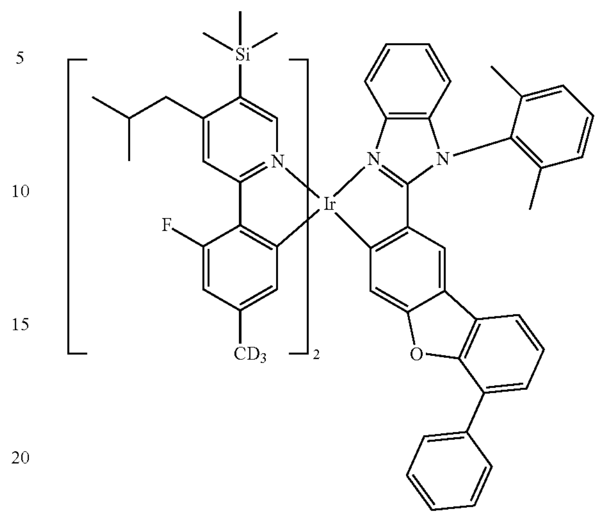
2221
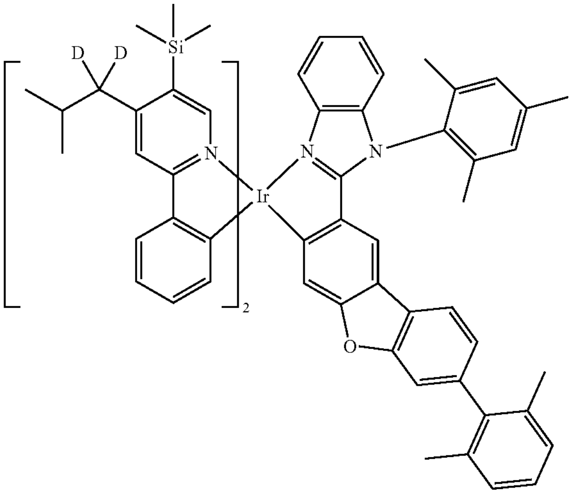
2222
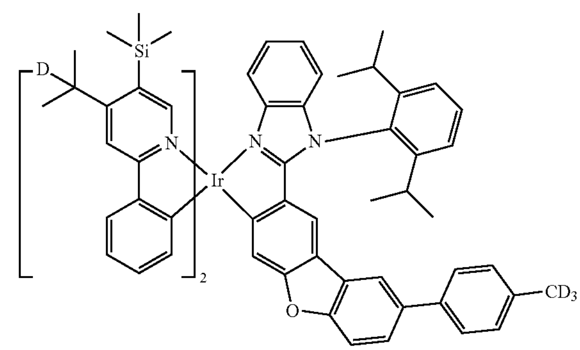

-continued
2223
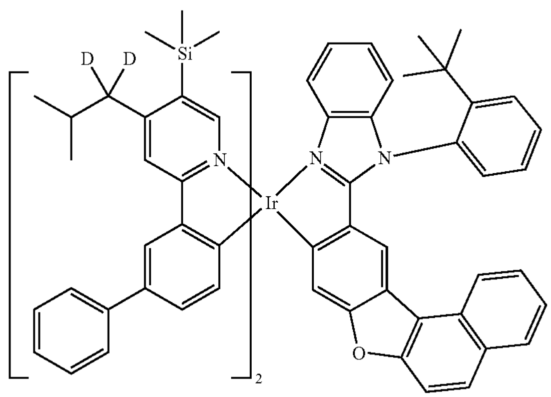
2224
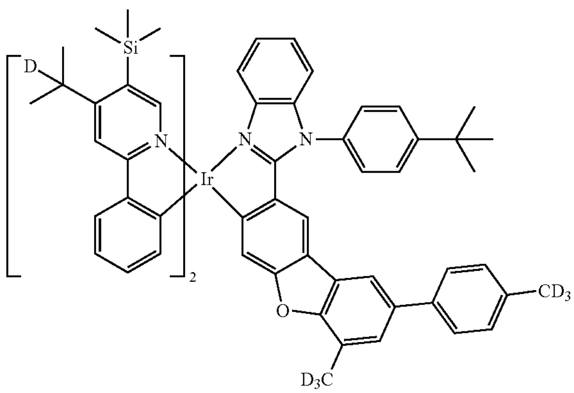
2225
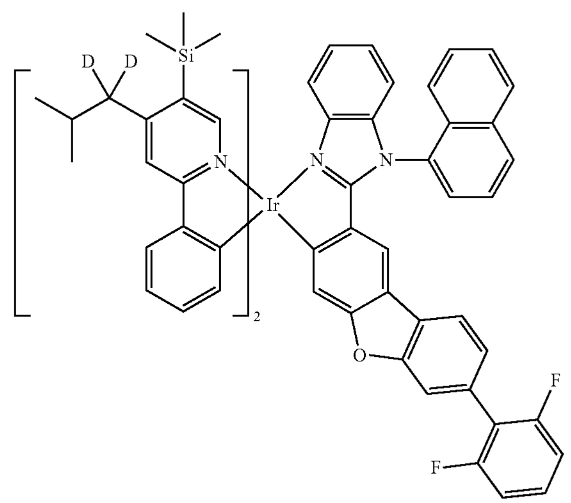
-continued
2226
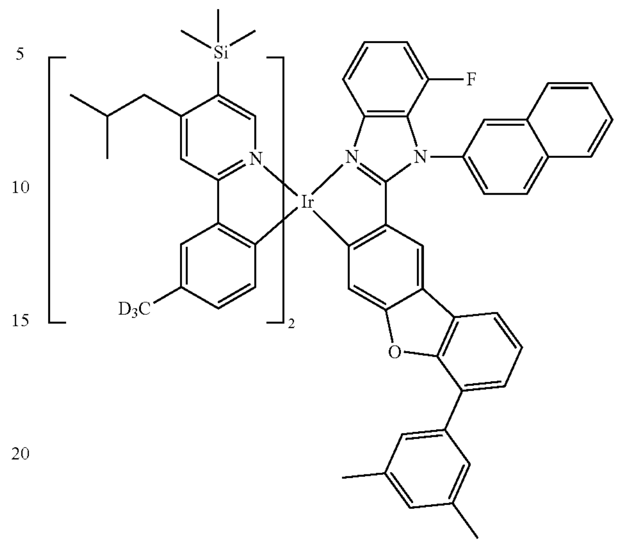
2227
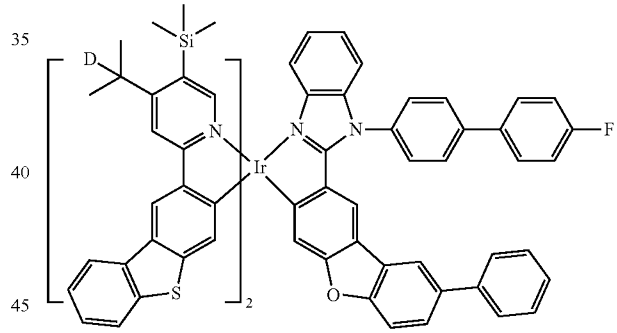
2228
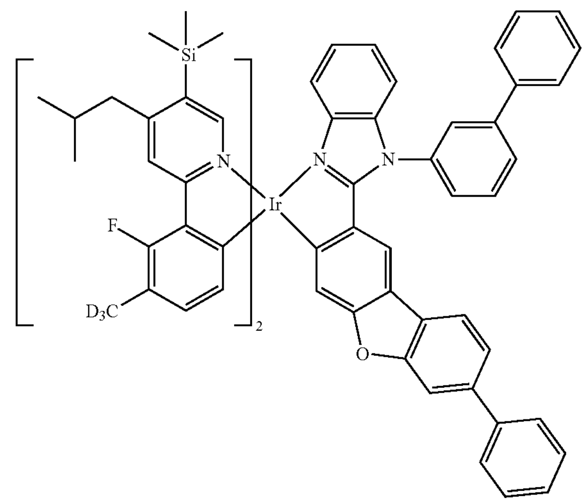

-continued
2229
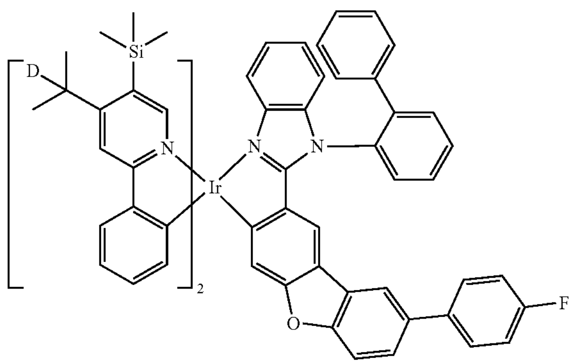
2230
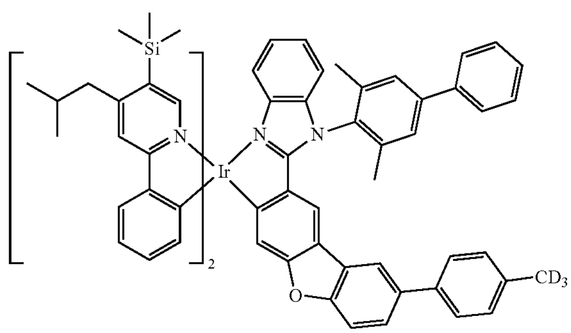
2231
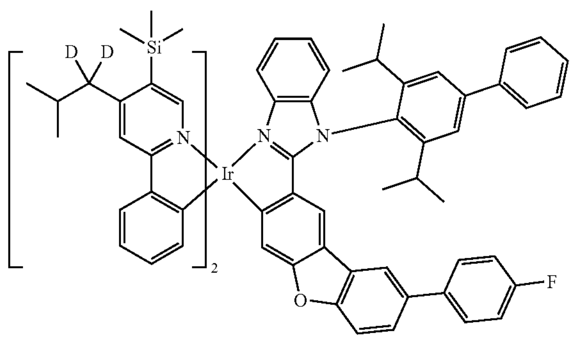
2232
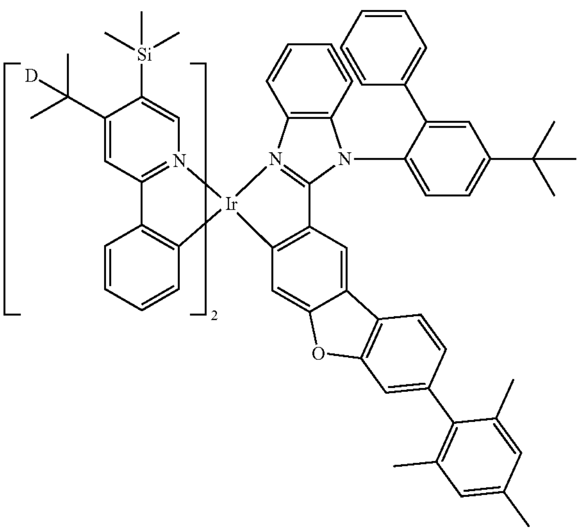
-continued
2233
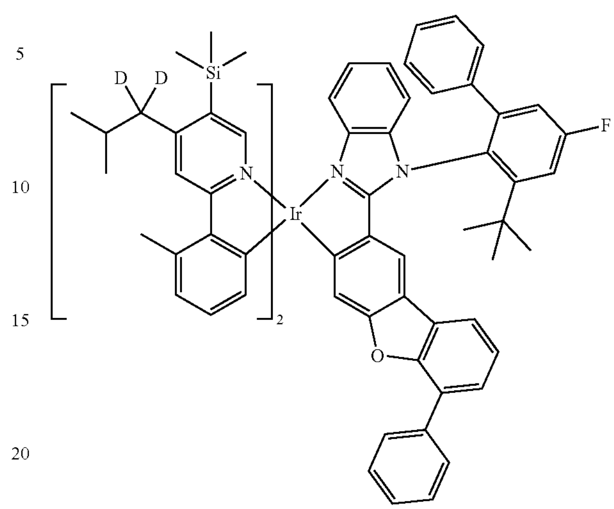
2234
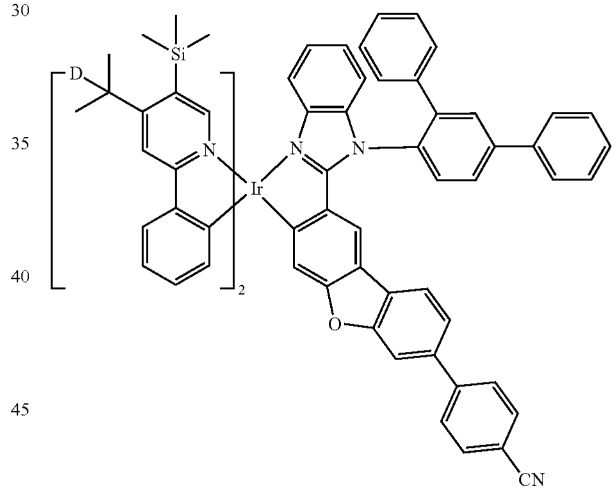
2235
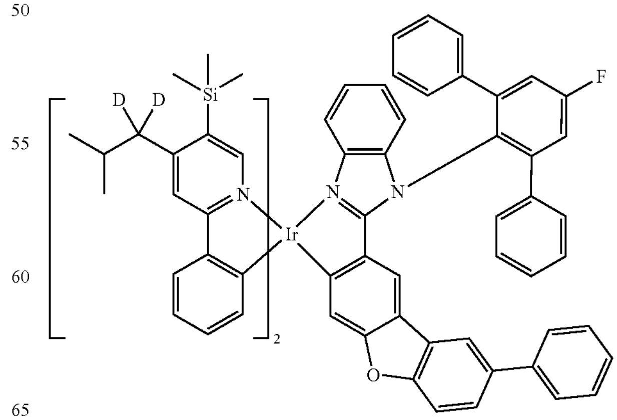

-continued
2236
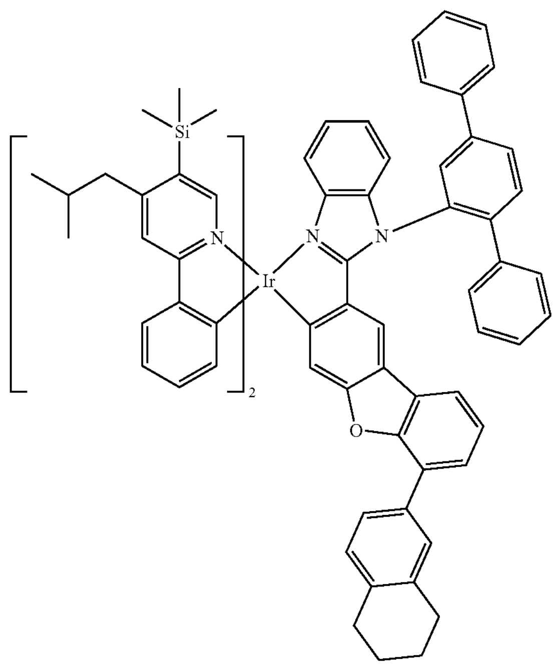
2237
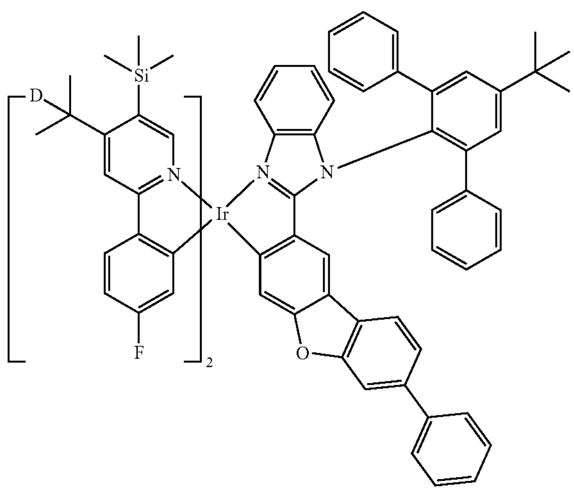
2238
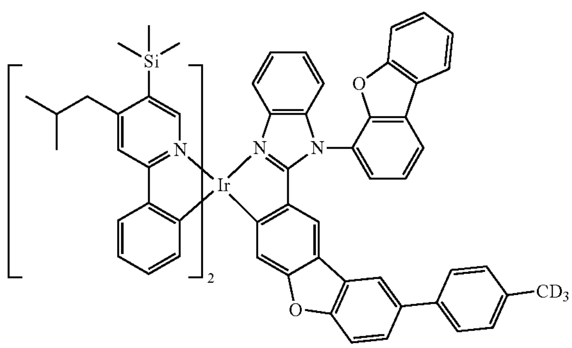
-continued
2239
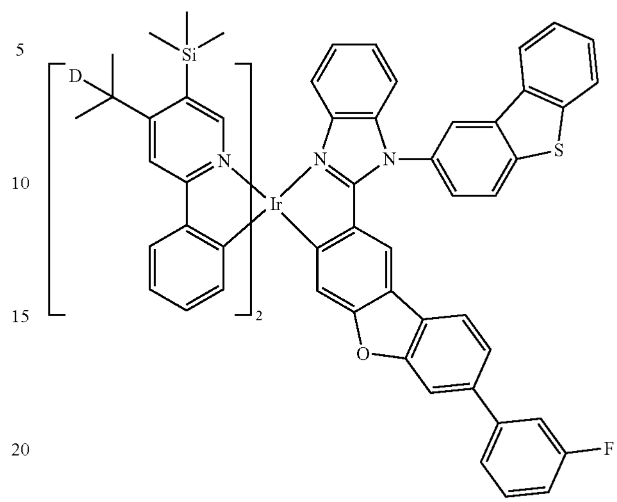
2240
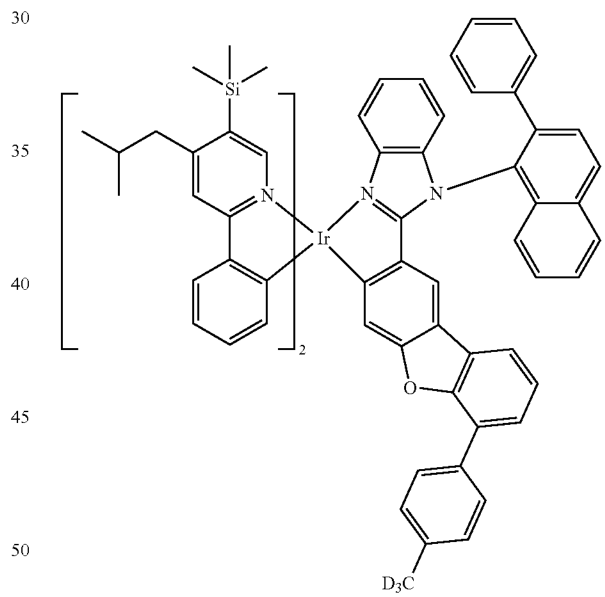
2241
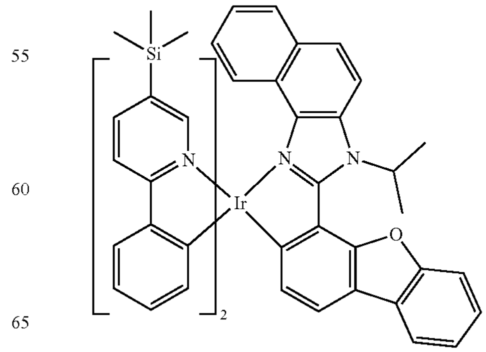

-continued
2242
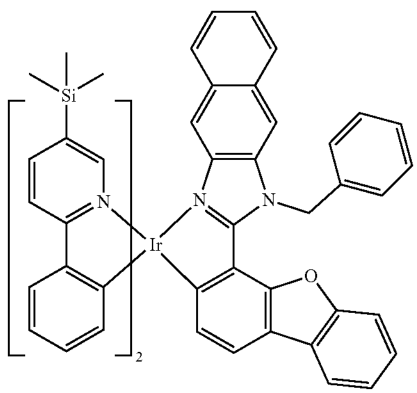
2243
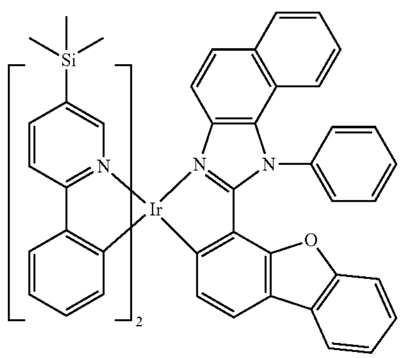
2244
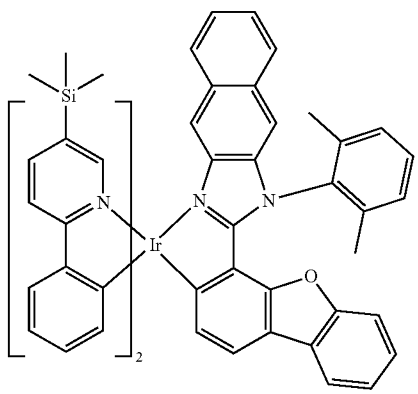
2245
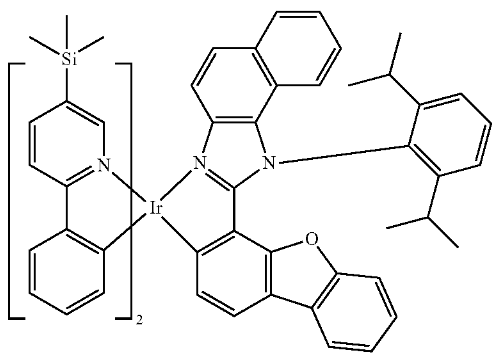
-continued
2246
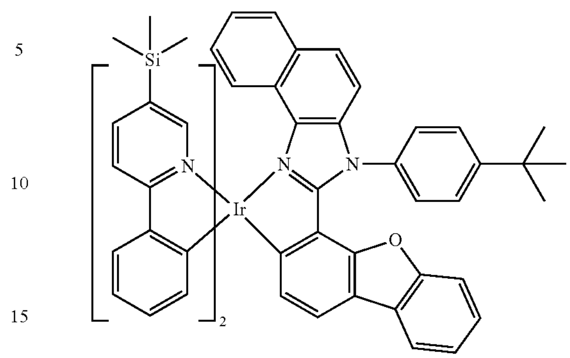
2247
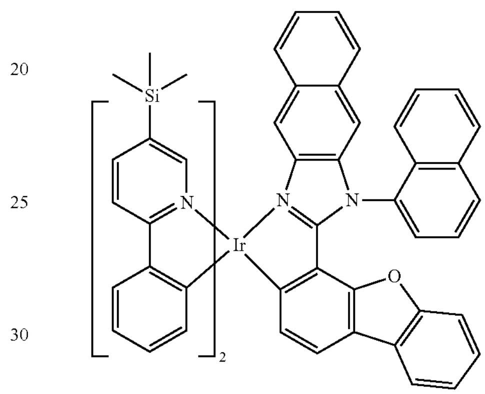
2248
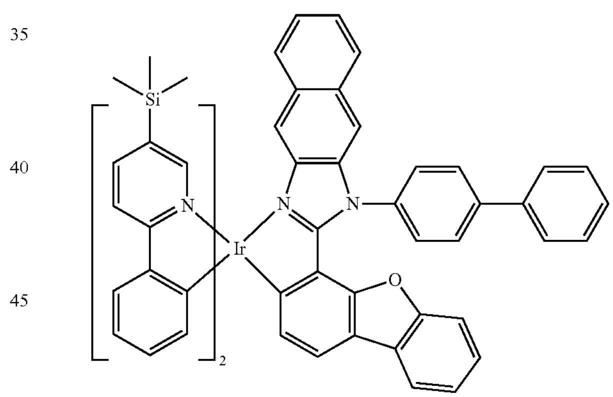
2249
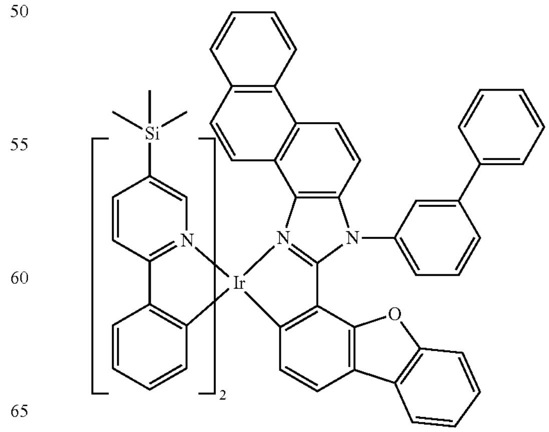

-continued
2250
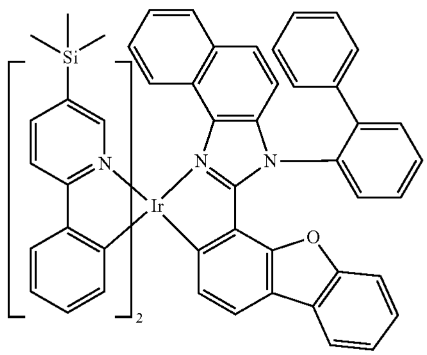
2251
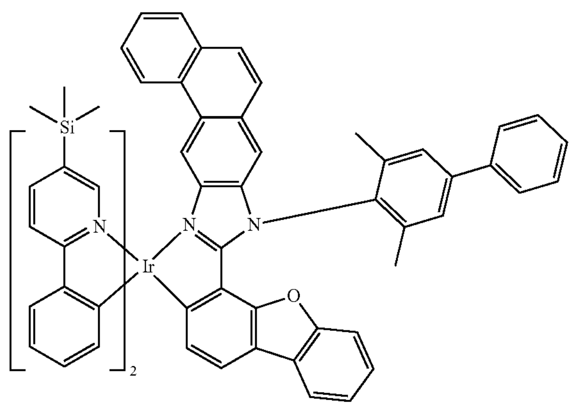
2252
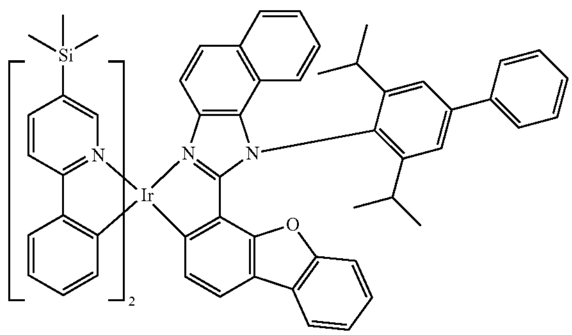
2253
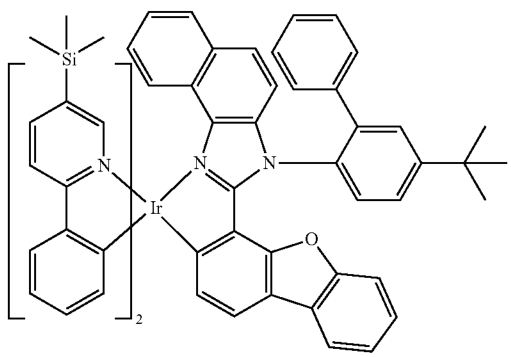
2254
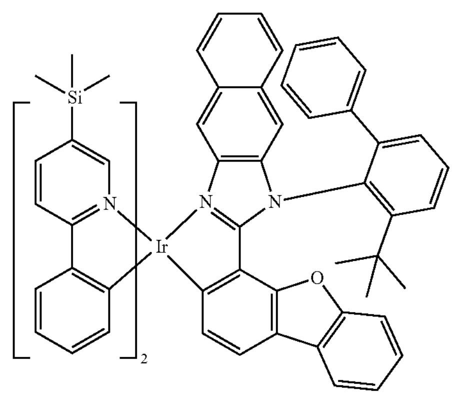
2255
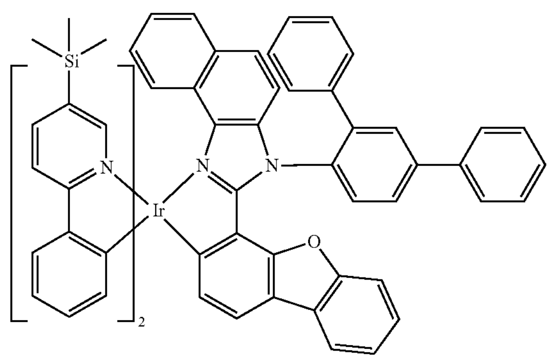
2256
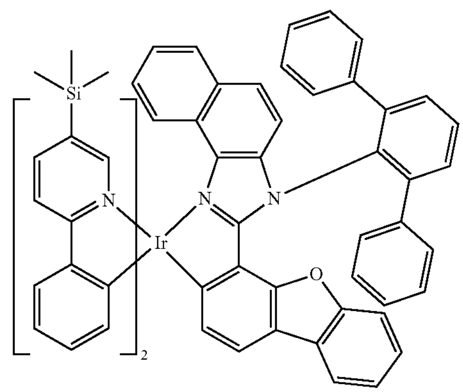
2257
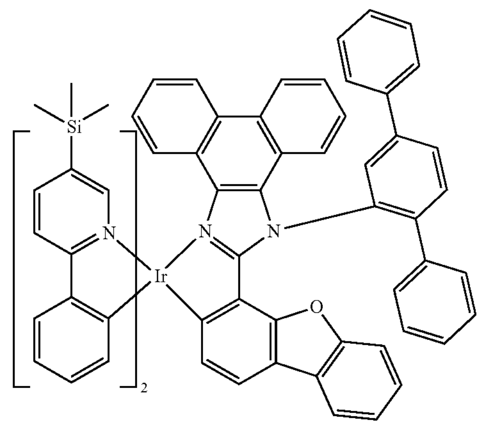

2258
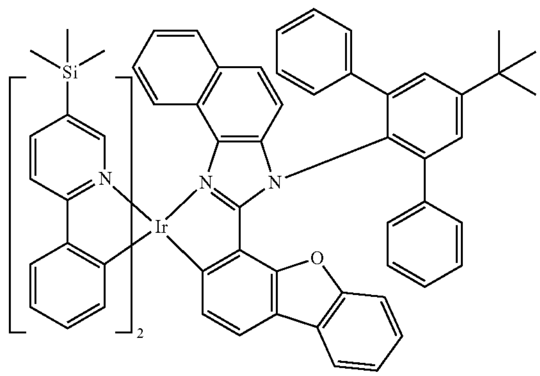
2259
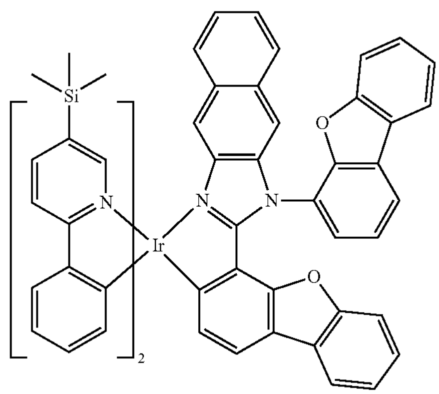
2260
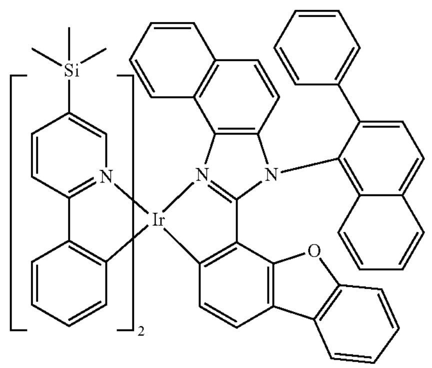
2261
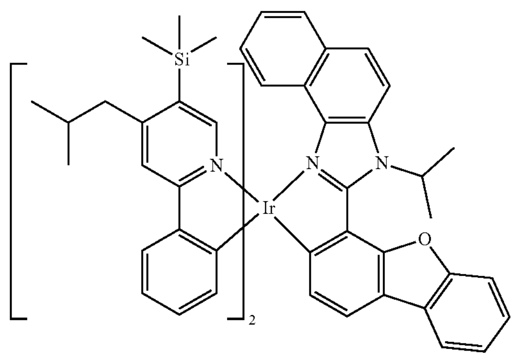
2262
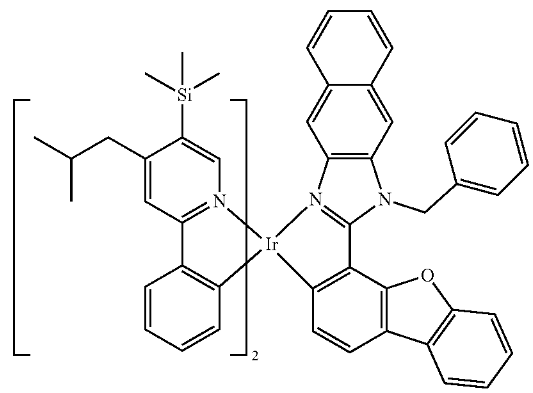
2263
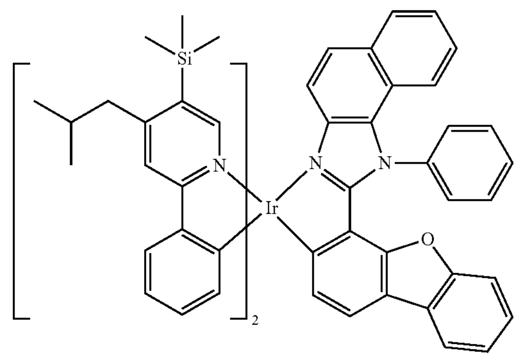
2264
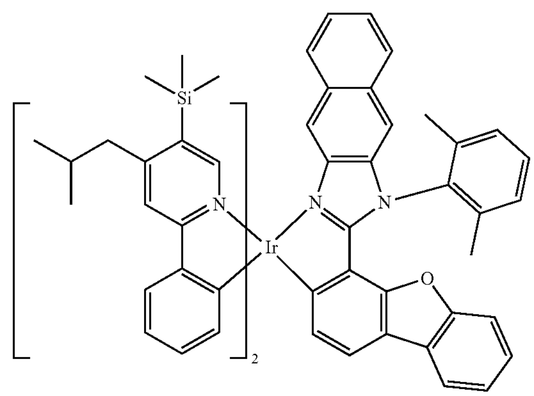
2265
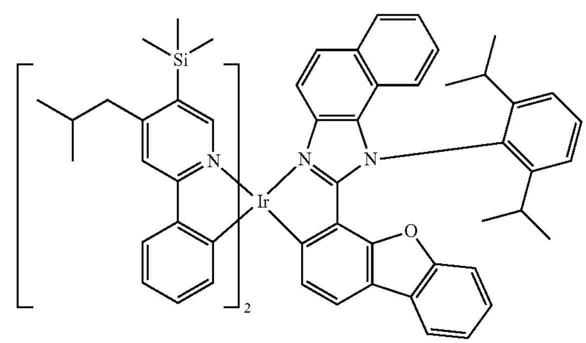

-continued
2266
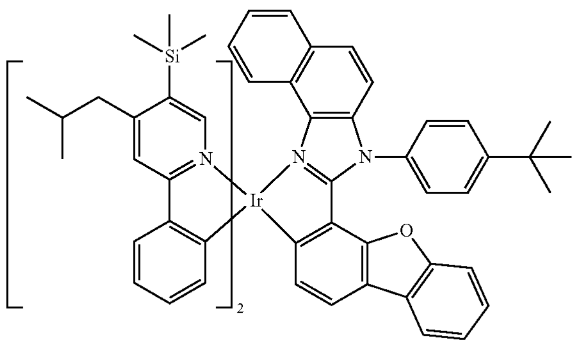
2267
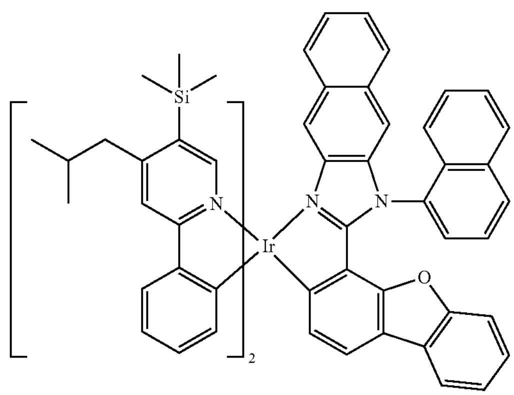
2268
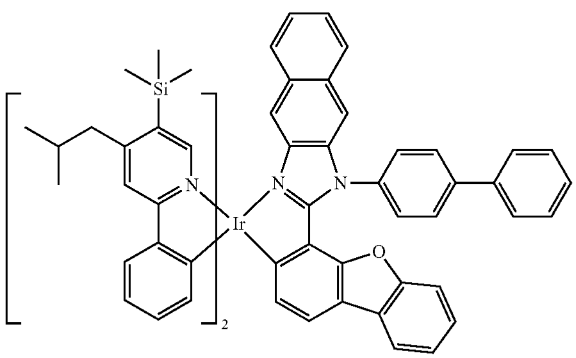
2269
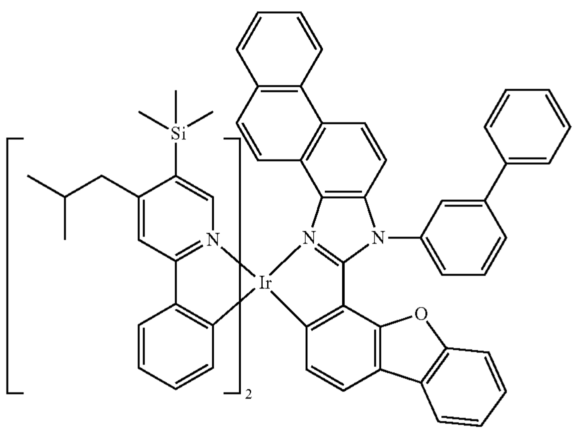
-continued
2270
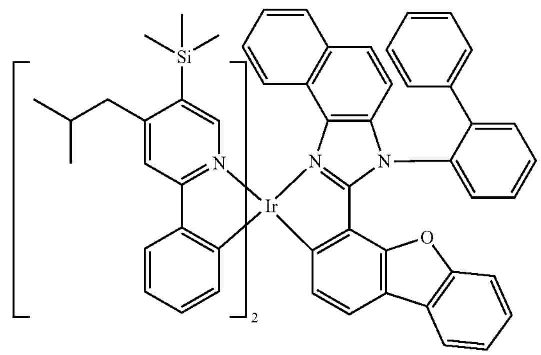
2271
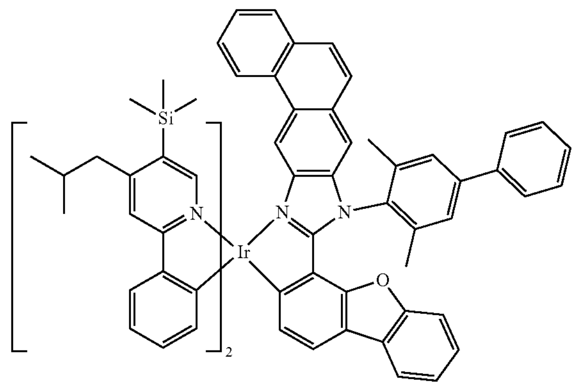
2272
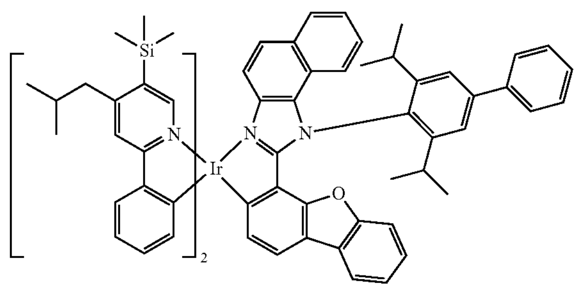
2273
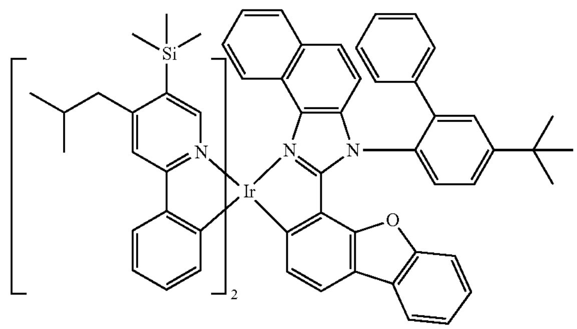

-continued
2274
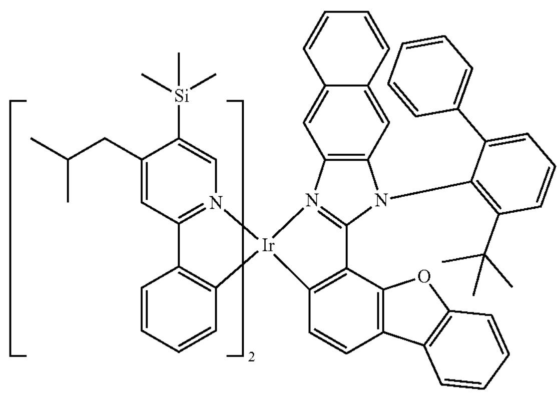
2275
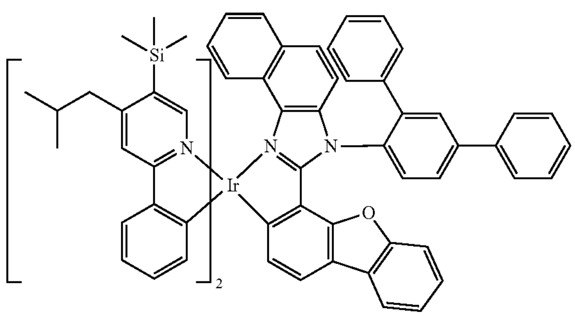
2276
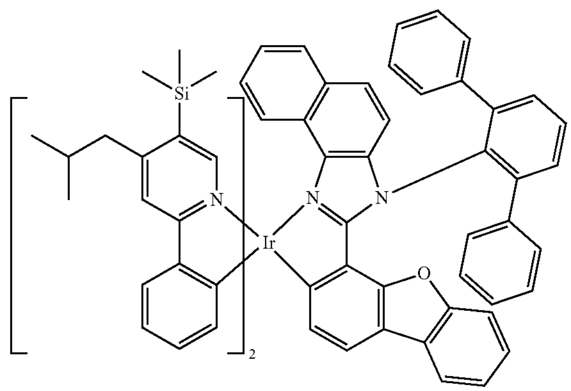
2277
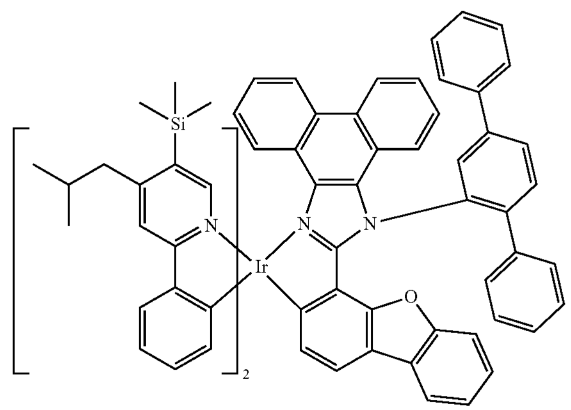
-continued
2278
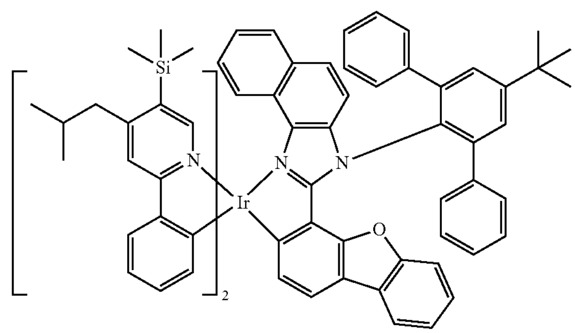
2279
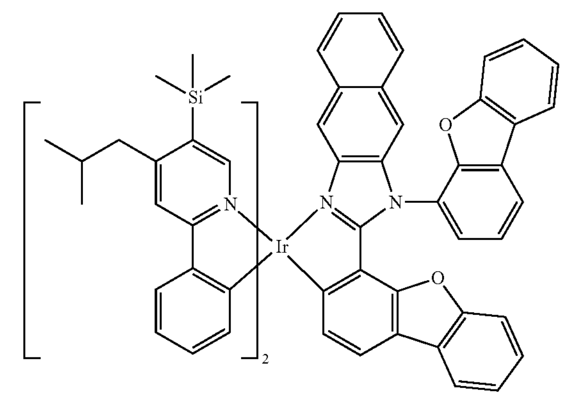
2280
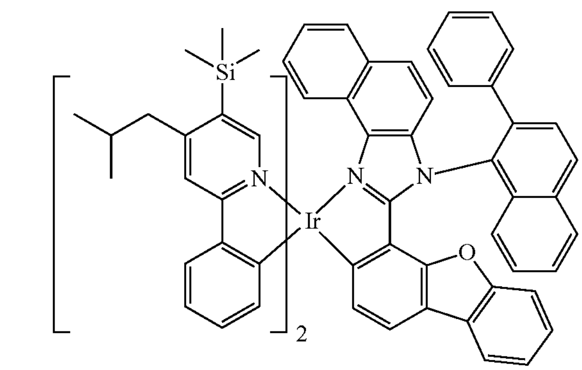

2281
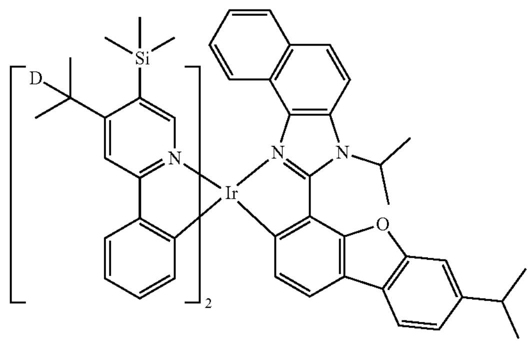
2282
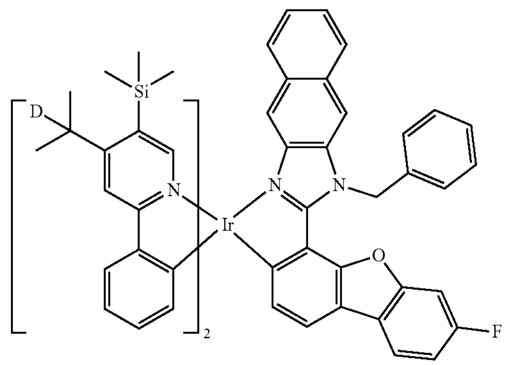
2283
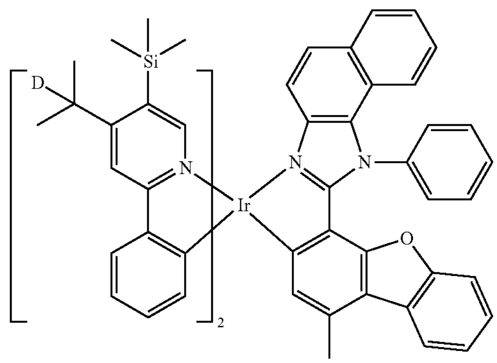
2284
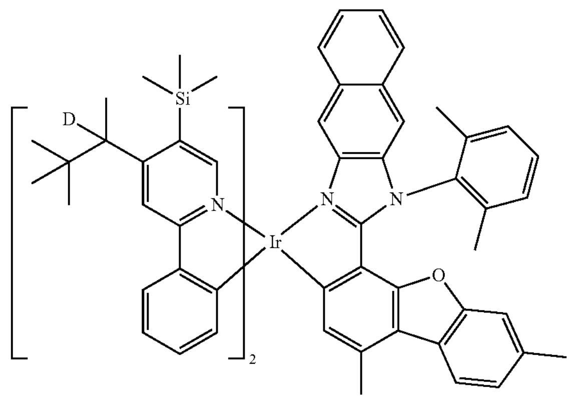
2285
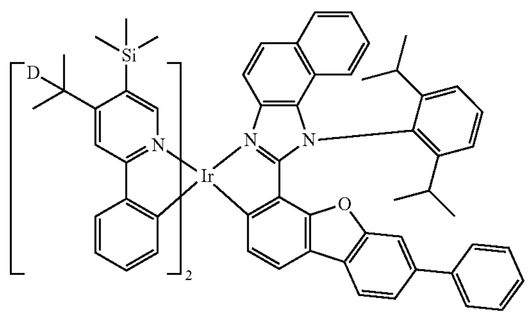
2286
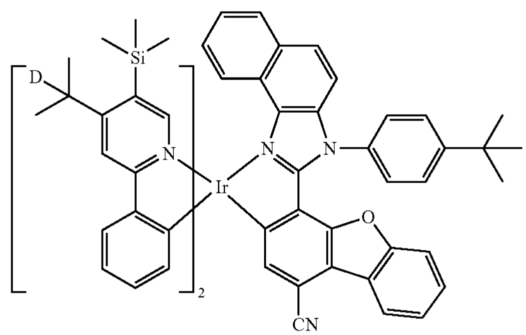
2287
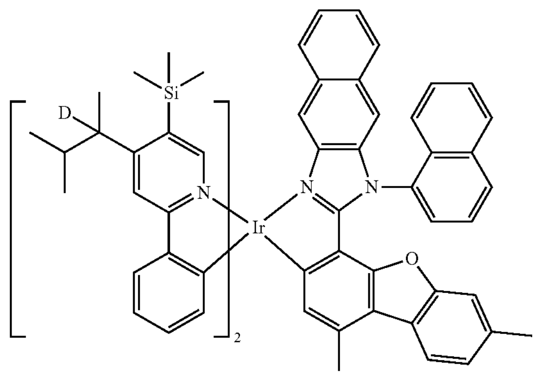
2288
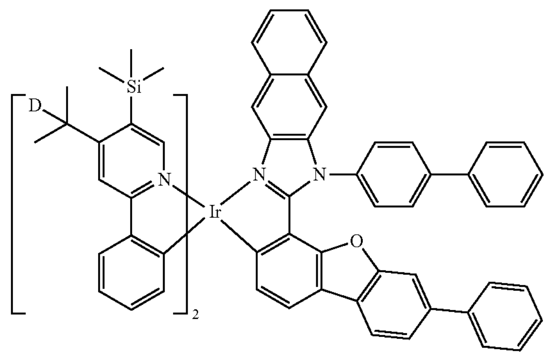

-continued
2289
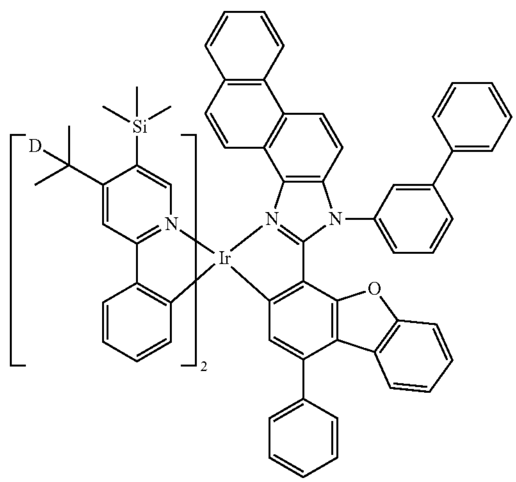
2290
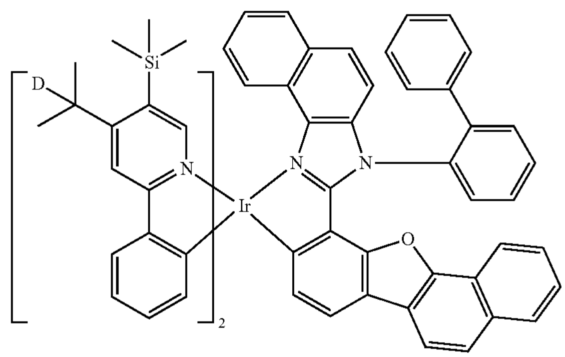
2291
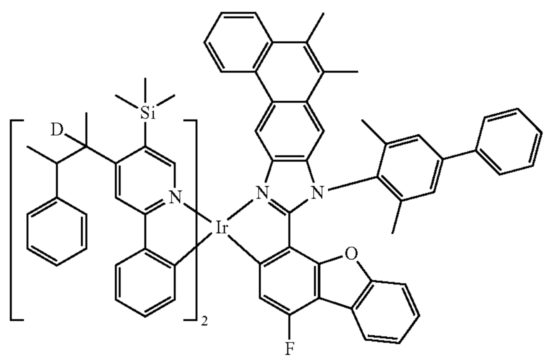
2292
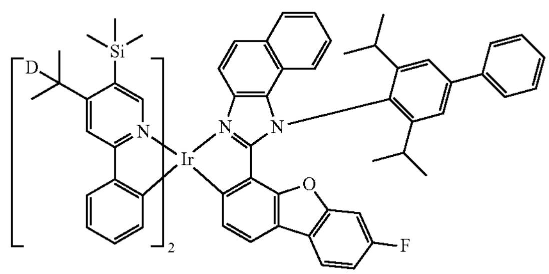
2293
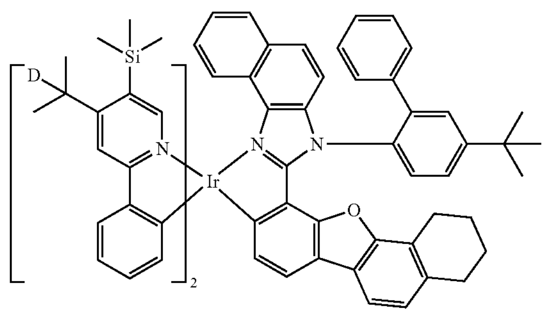
2294
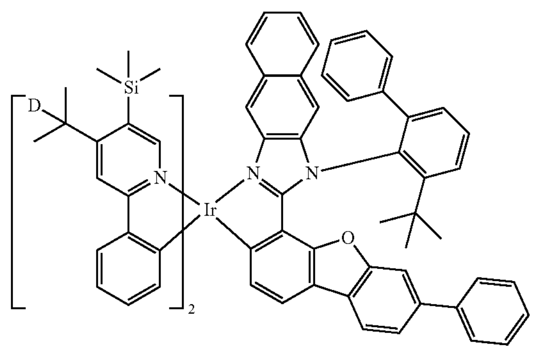
2295
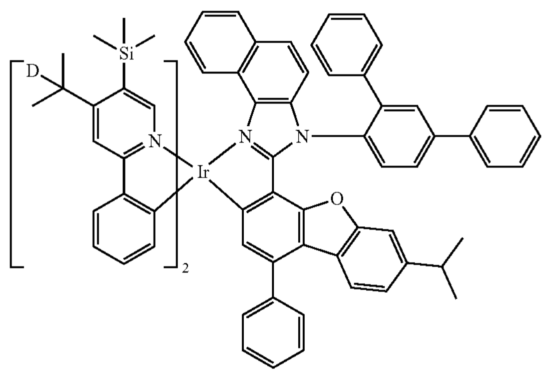
2296
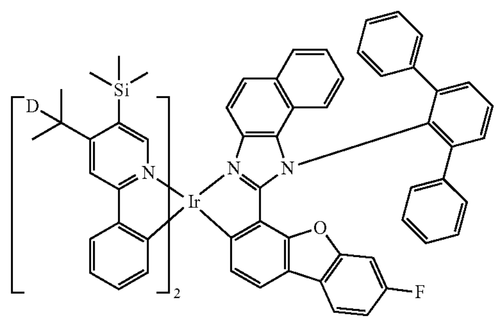

-continued
2297
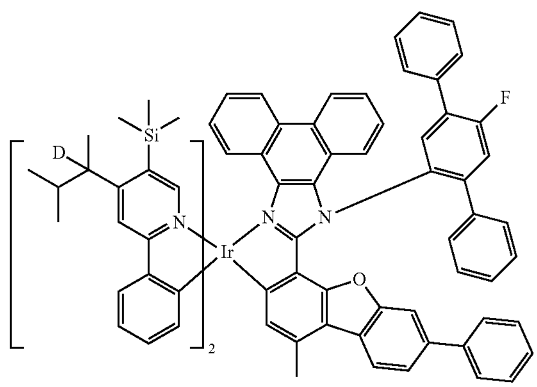
2298
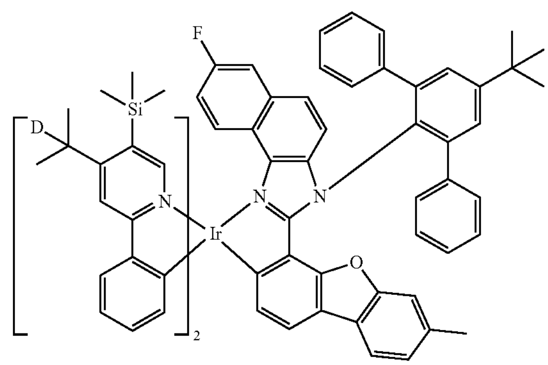
2299
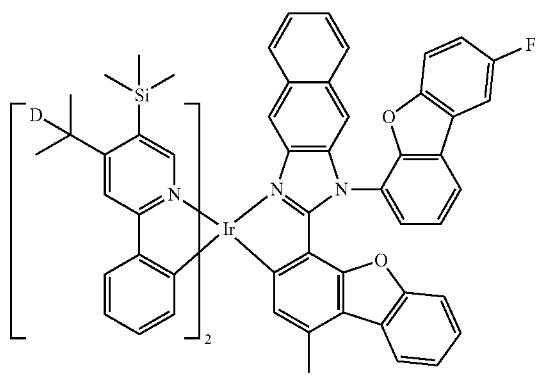
2300
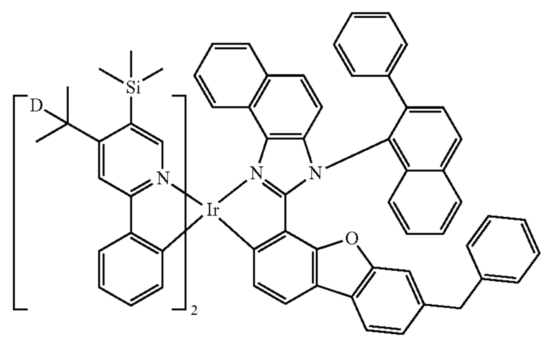
2301
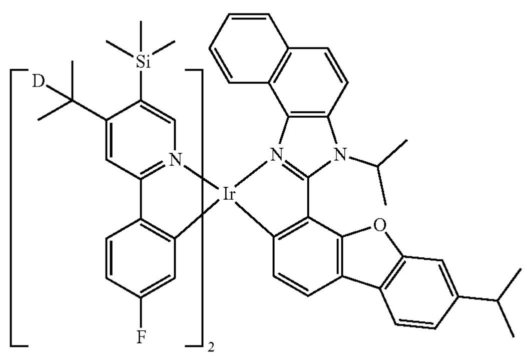
2302
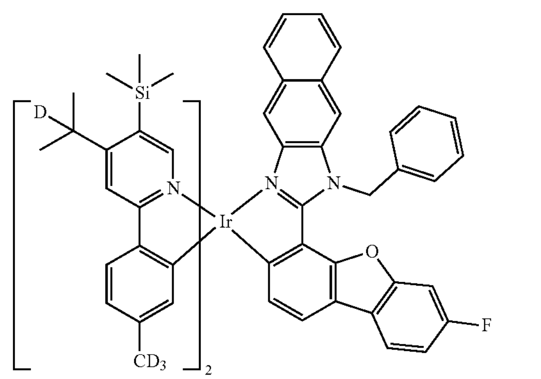
2303
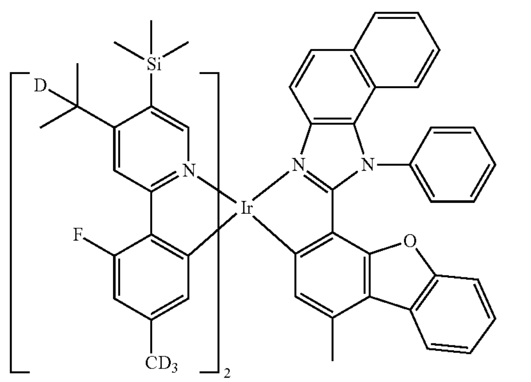
2304
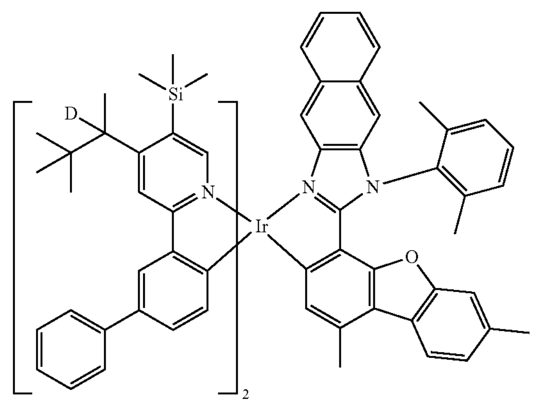

-continued
2305
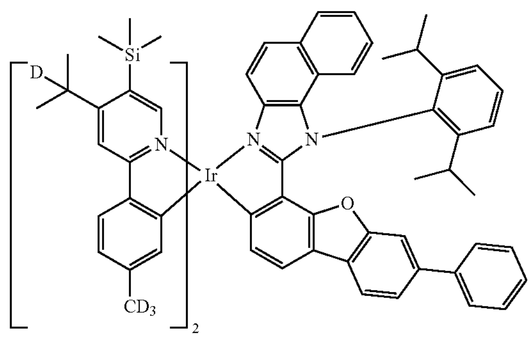
2306
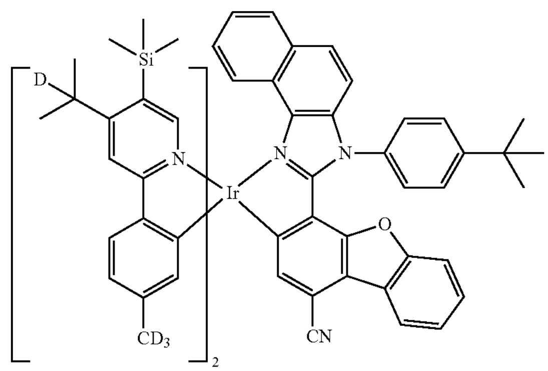
2307
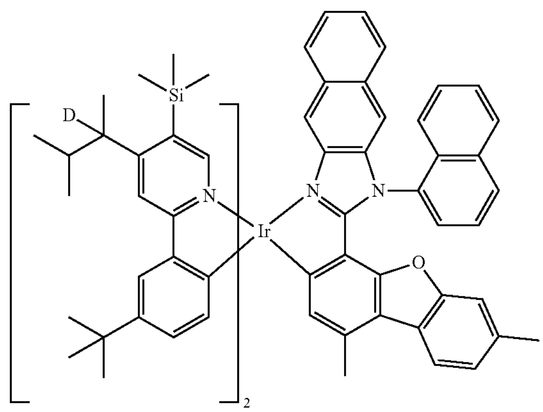
2308
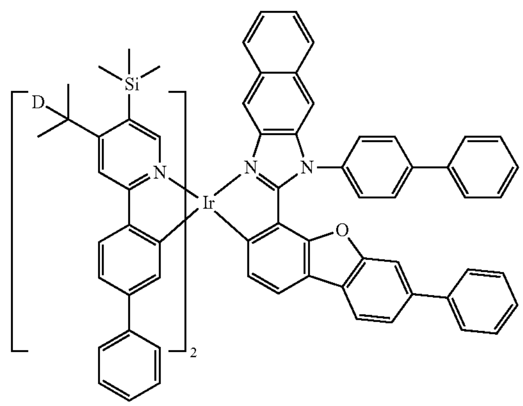
2309
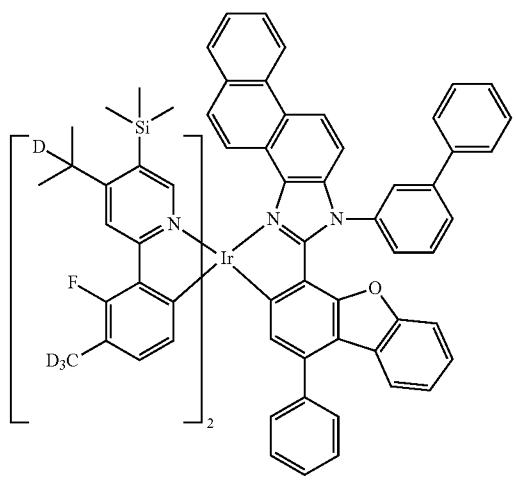
2310
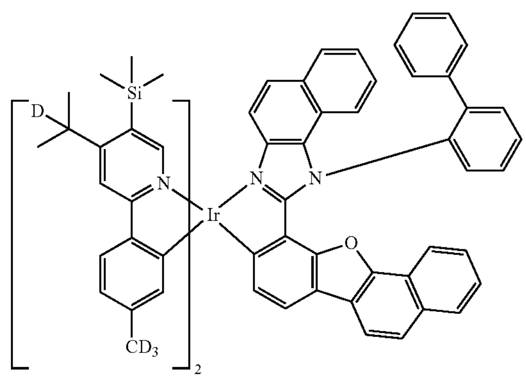

-continued
2311
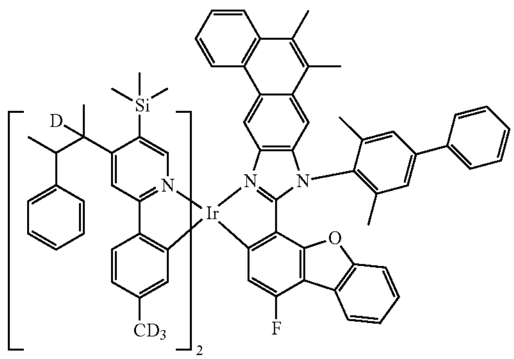
2312
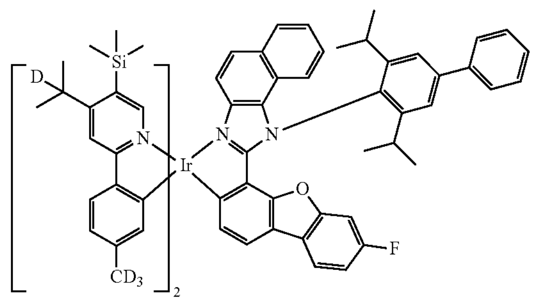
2313
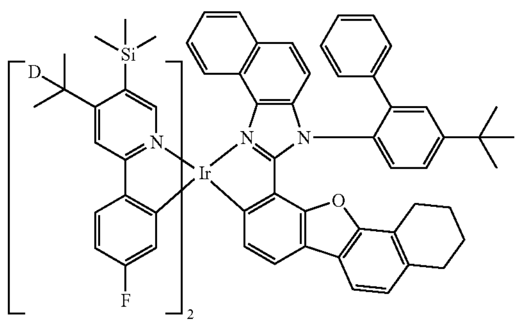
2314
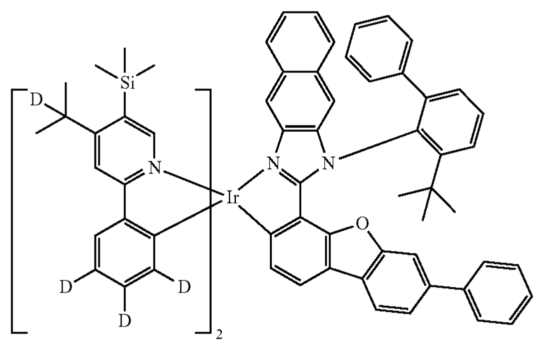
2315
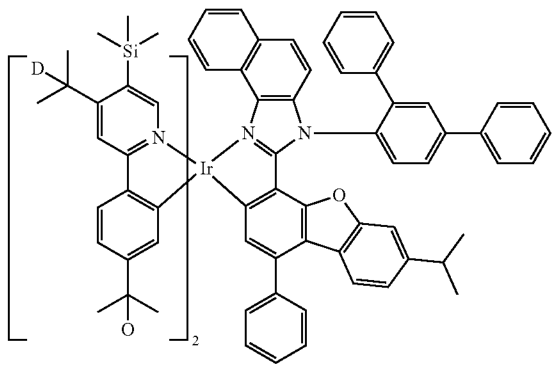
2316
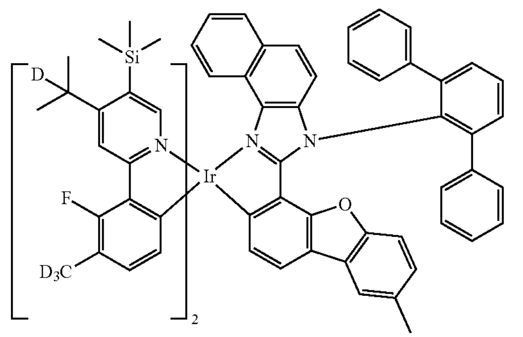
2317
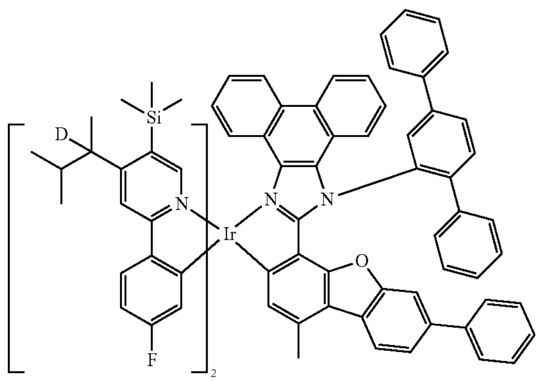
2318
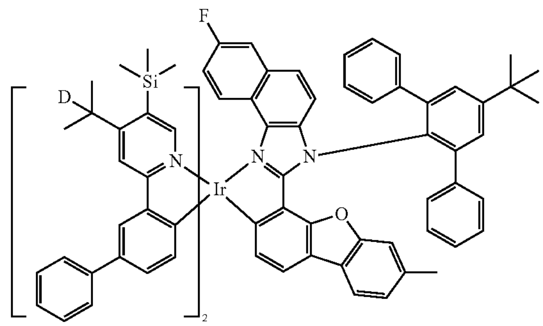

-continued
2319
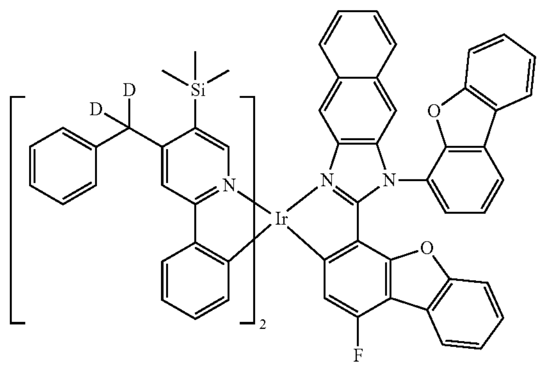
2320
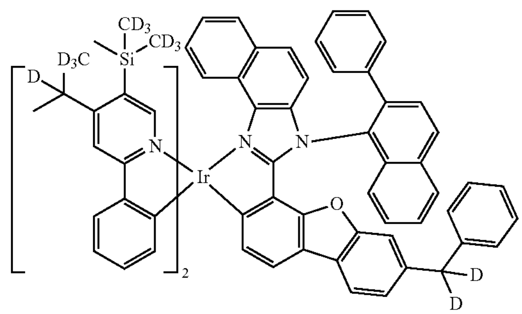
2321
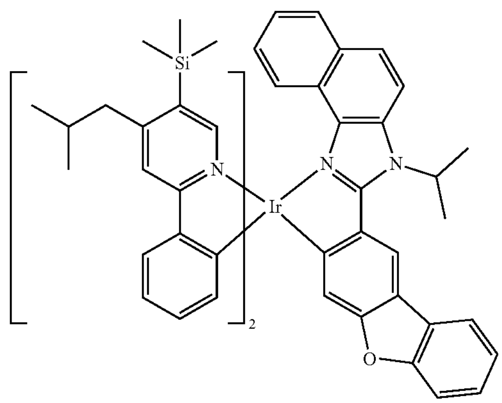
2322
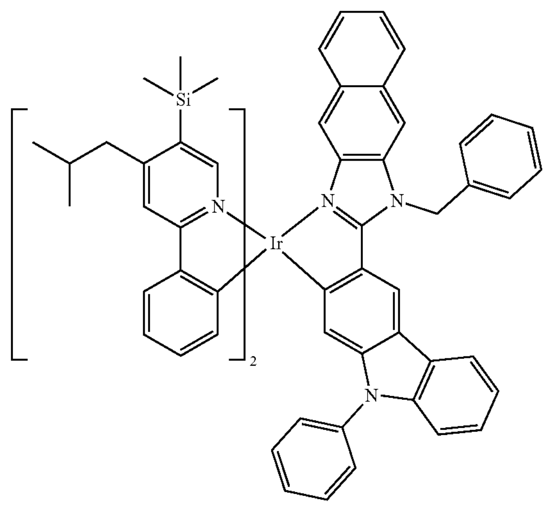
2323
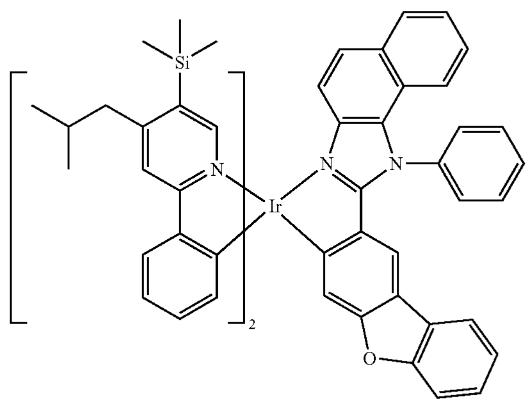
2324
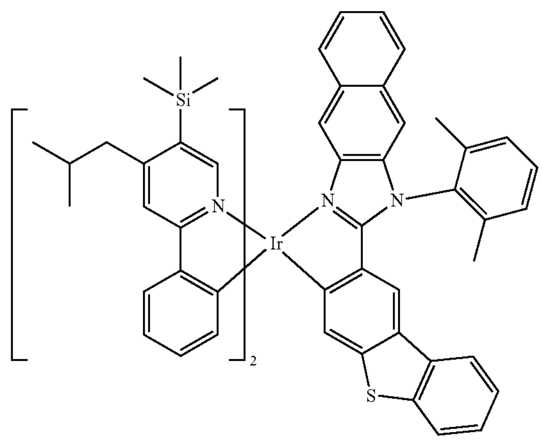

-continued
2325
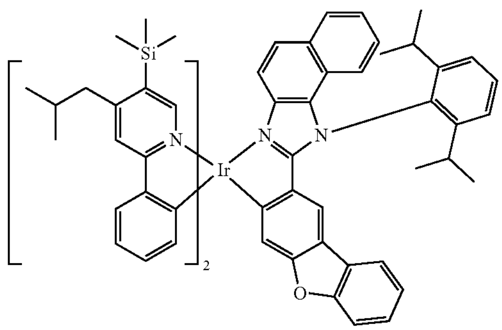
2326
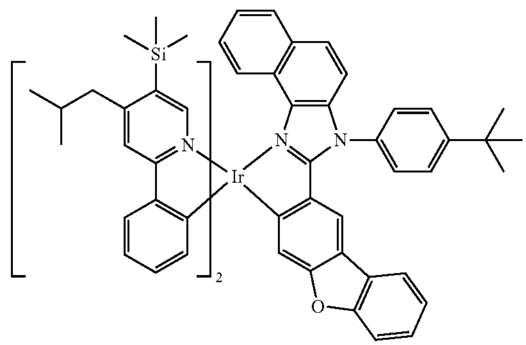
2327
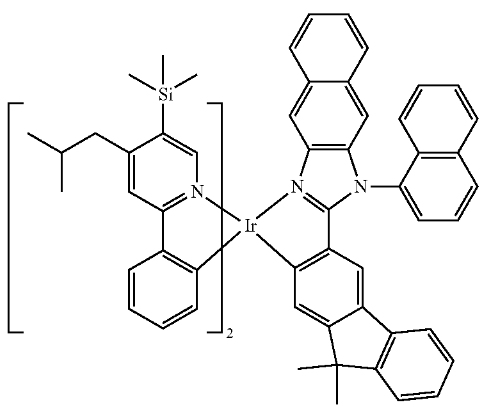
2328
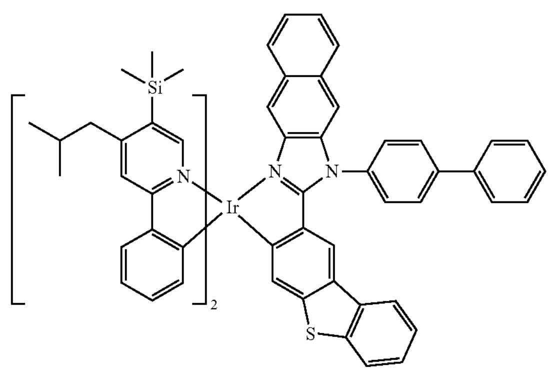
2329
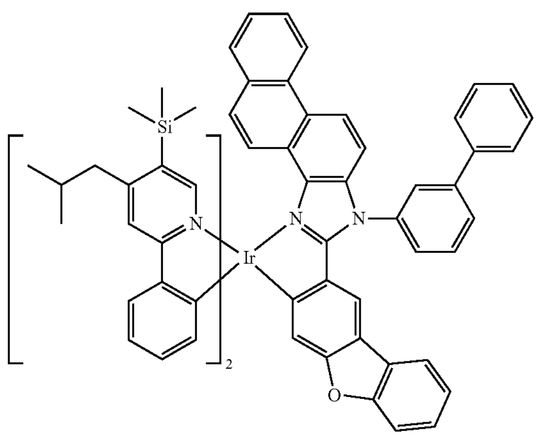
2330
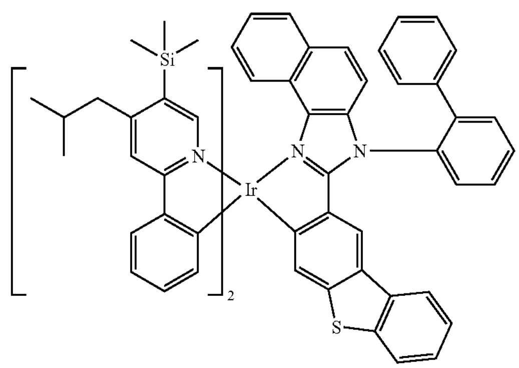
2331
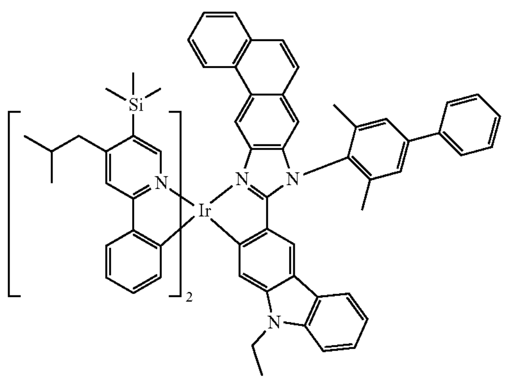
2332
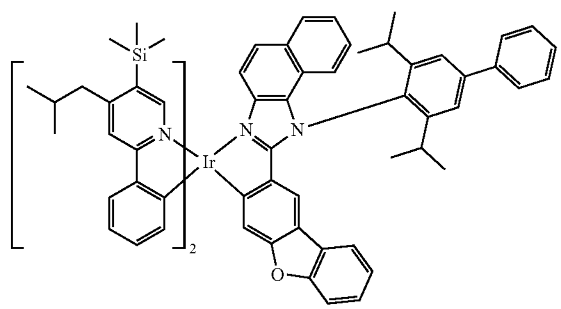

-continued
2333
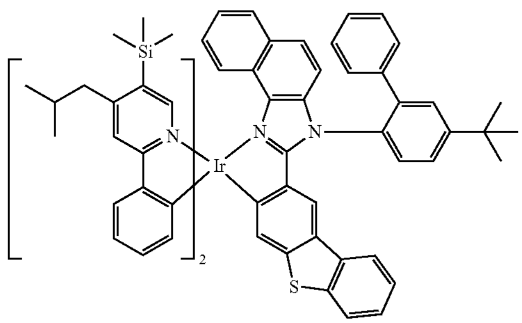
2334
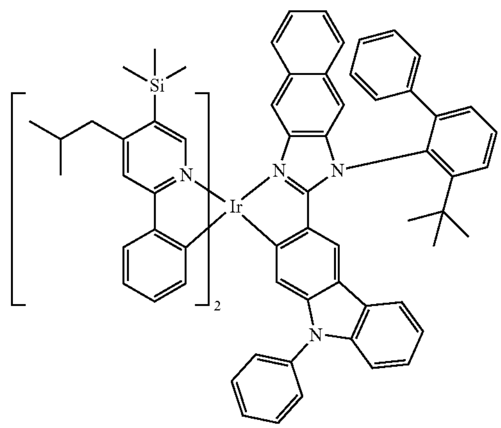
2335
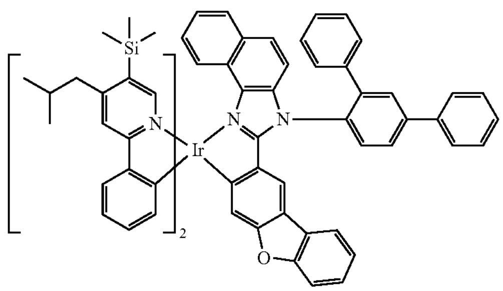
2336
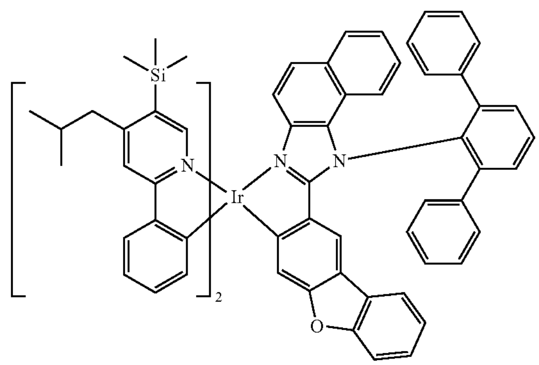
2337
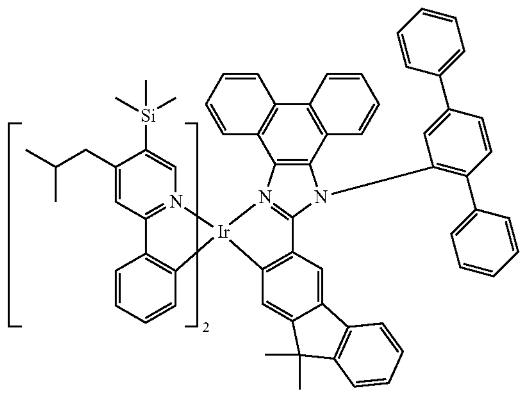
2338
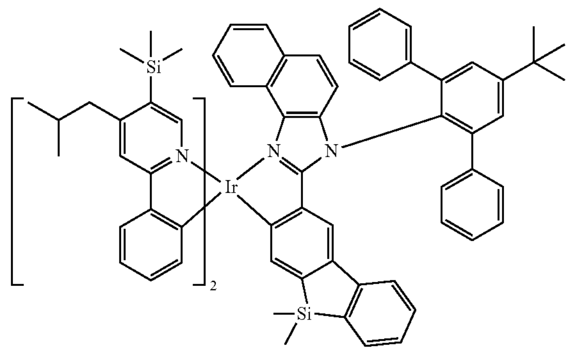

-continued
2339
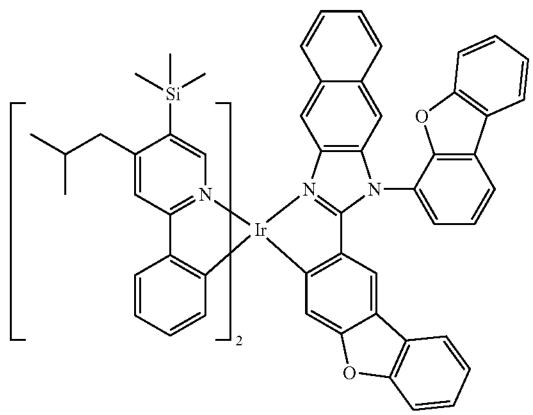
2340
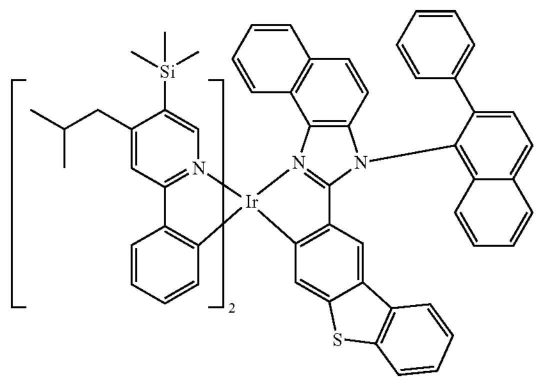
2341
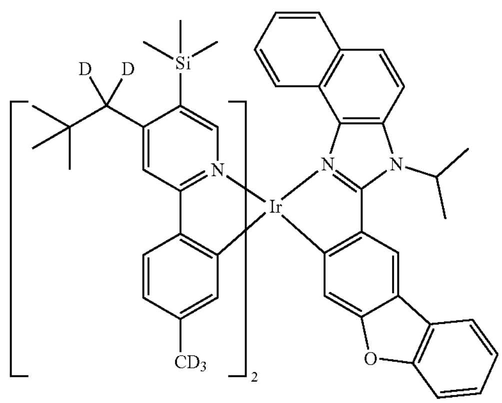
2342
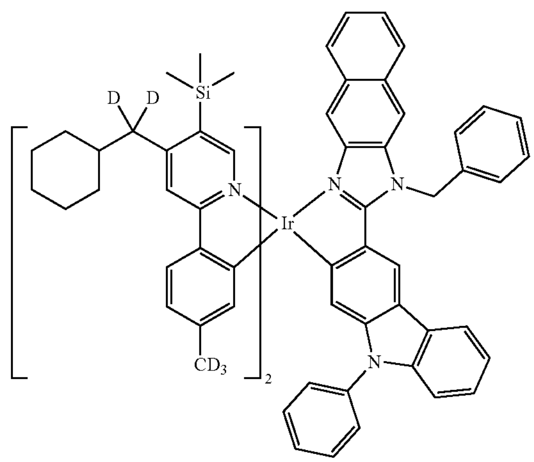
2343
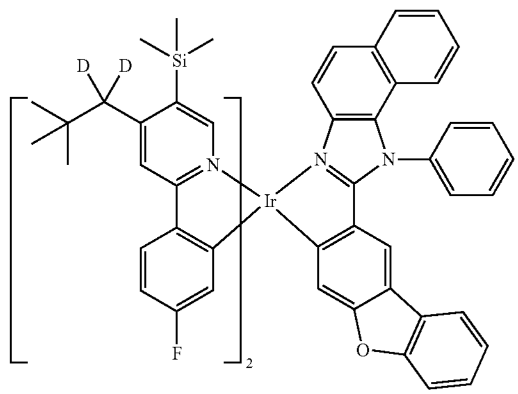
2344
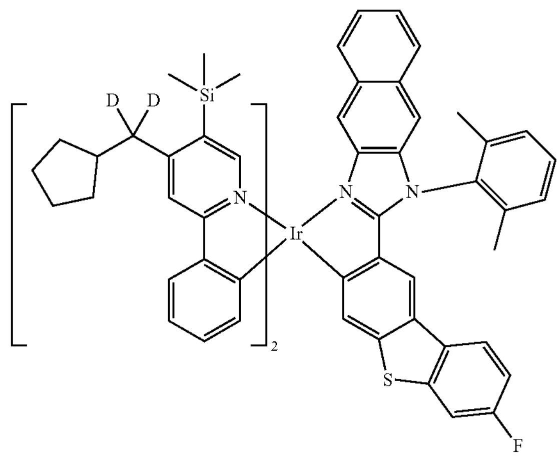

-continued
2345
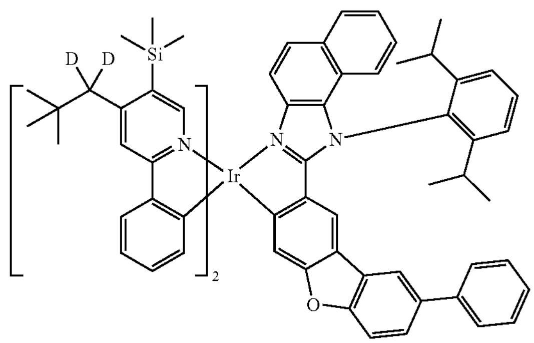
2346
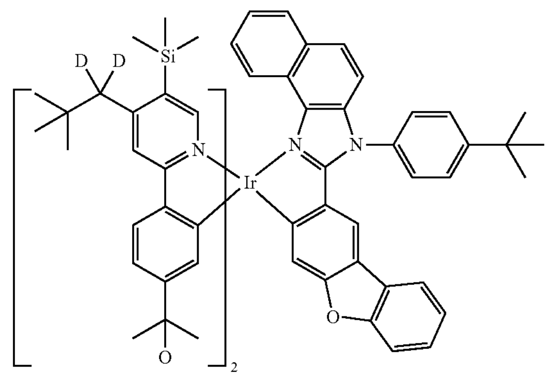
2347
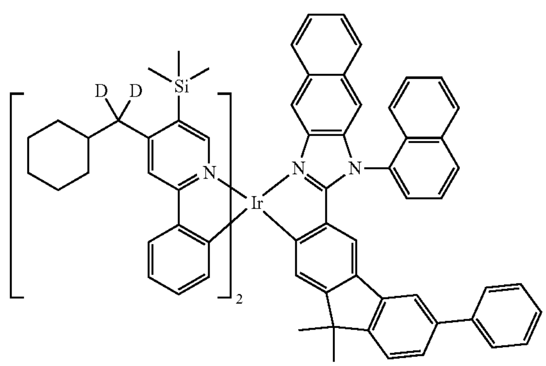
2348
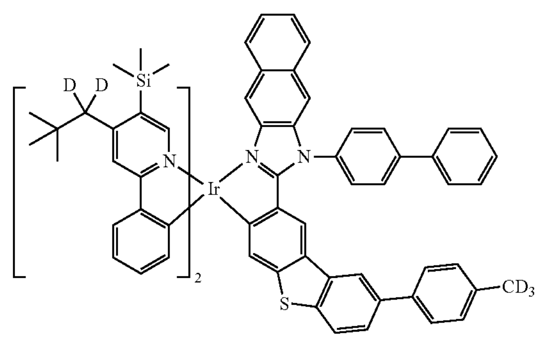
2349
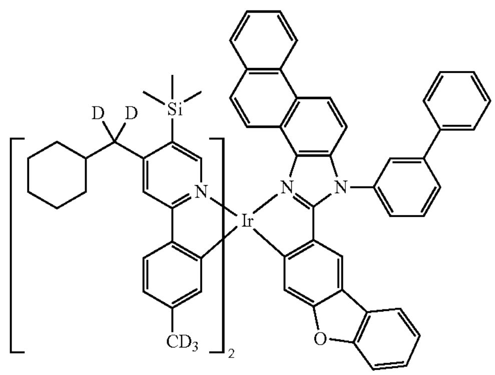
2350
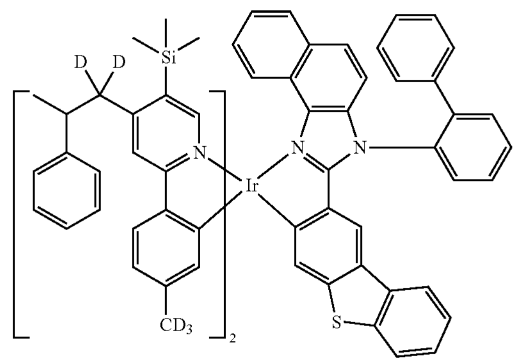
2351
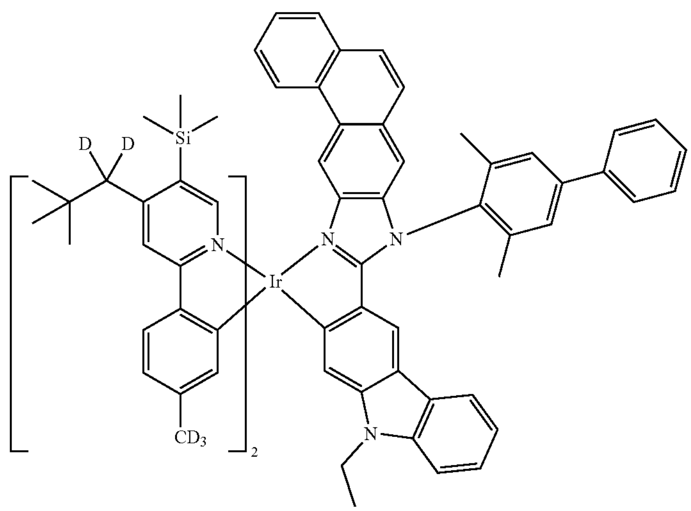

-continued
2352
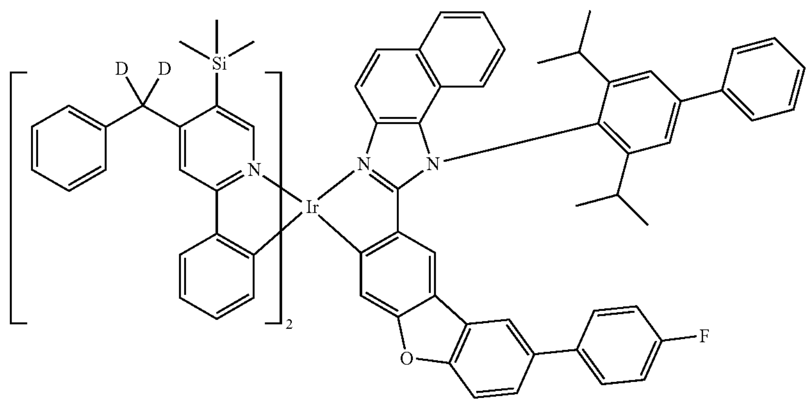
2353
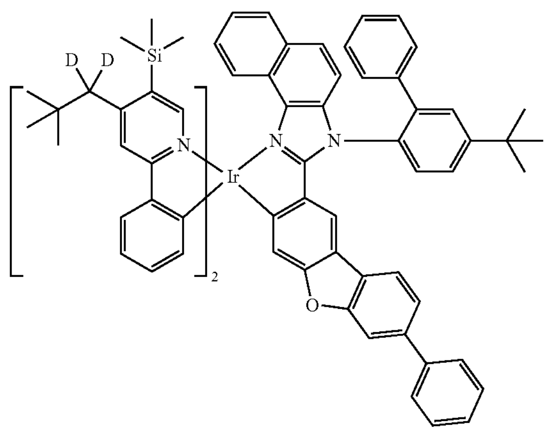
2354
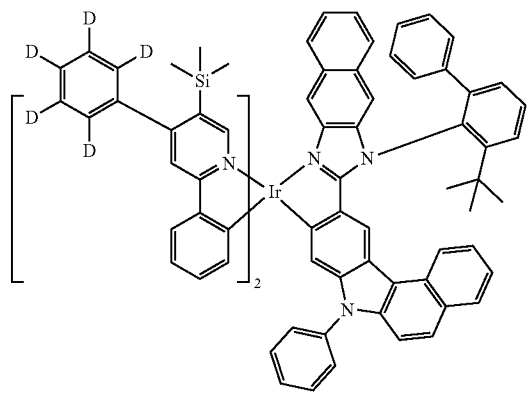
2355
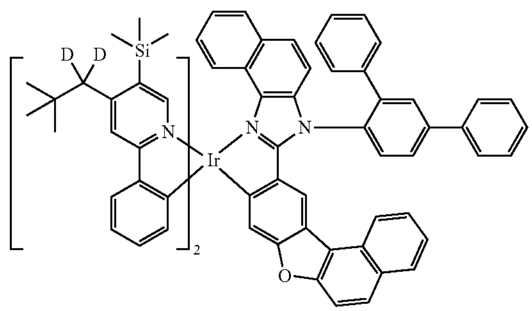
2356
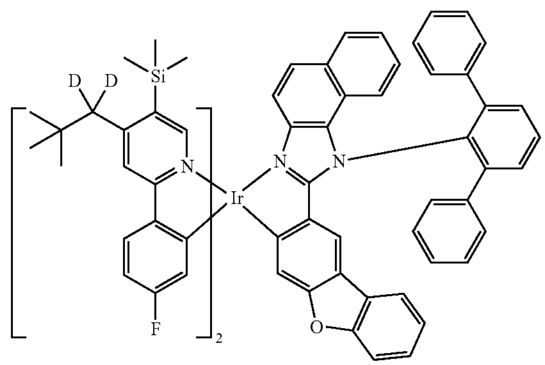
2357
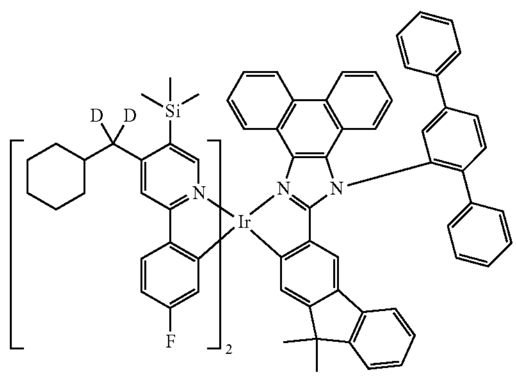
2358
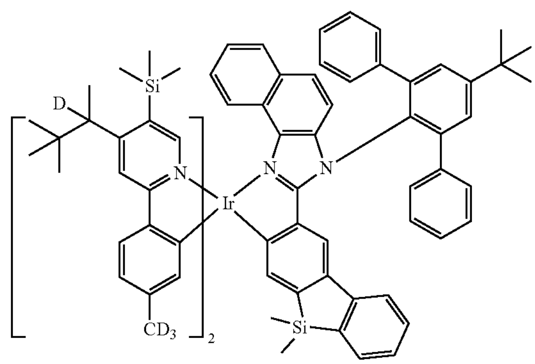

-continued
2359
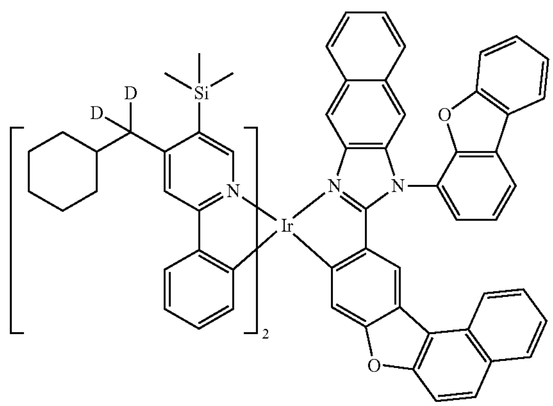
2360
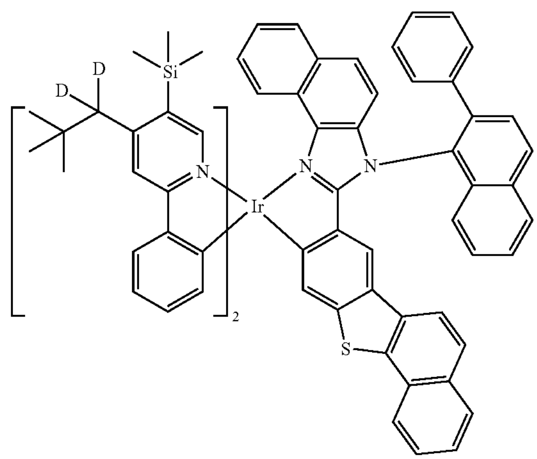
2361
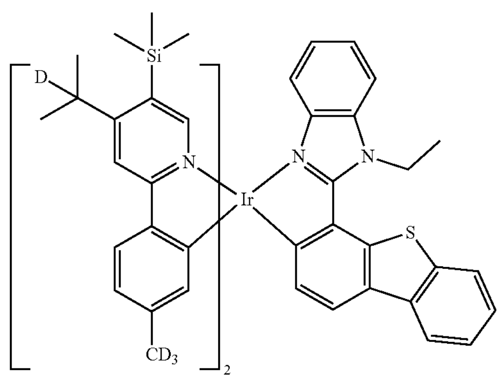
2362
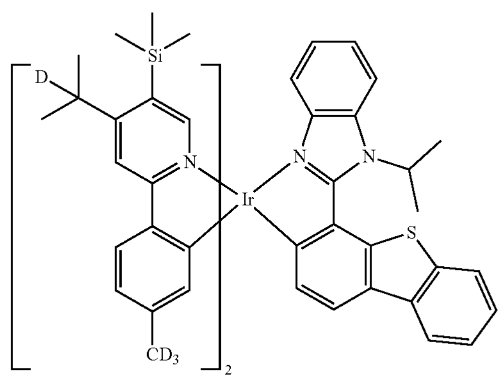
2363
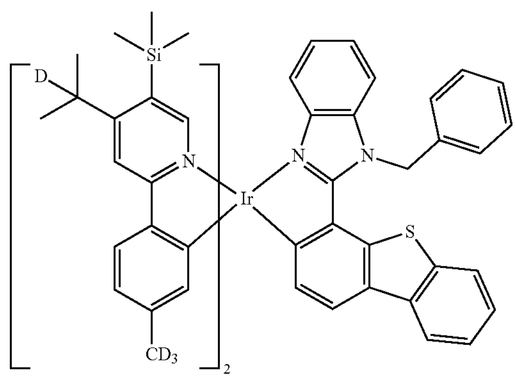
2364
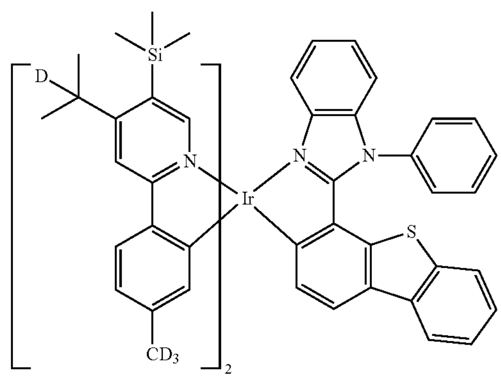
2365
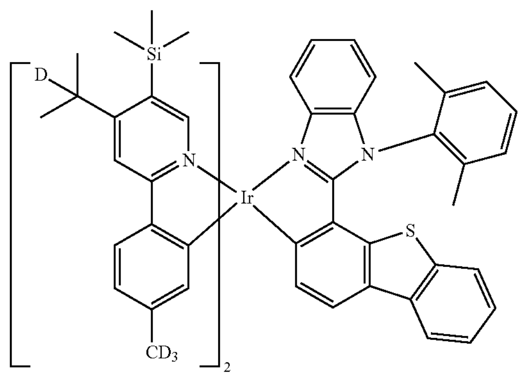
2366
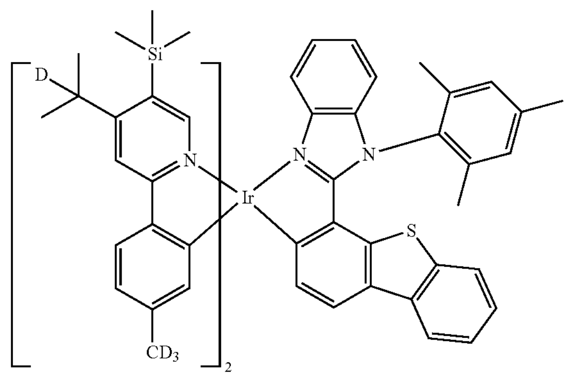

-continued
2367
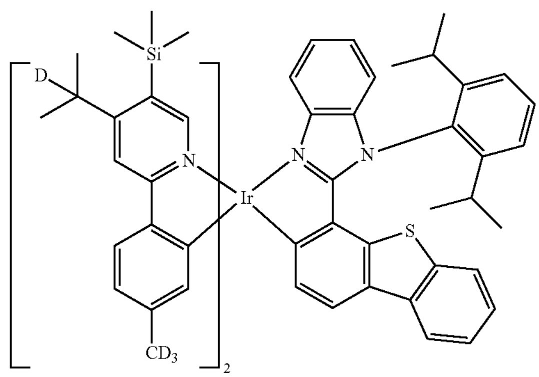
2368
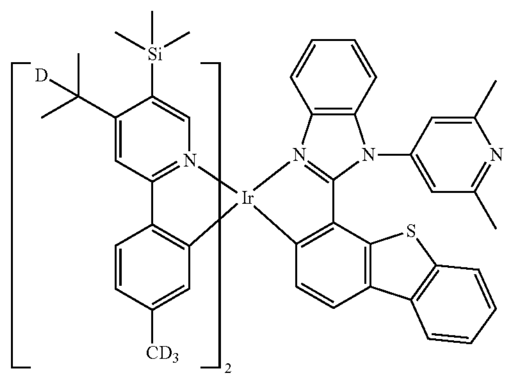
2369
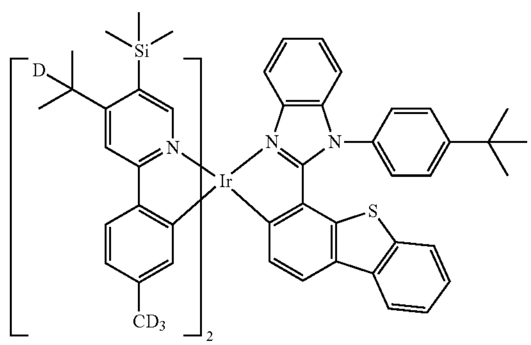
2370
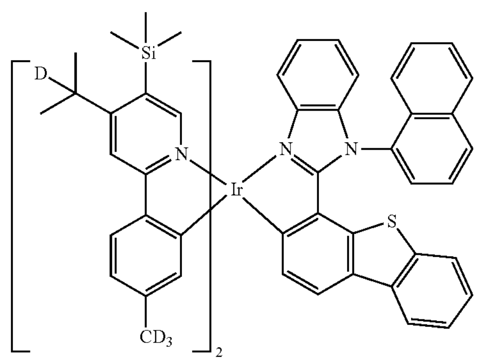
2371
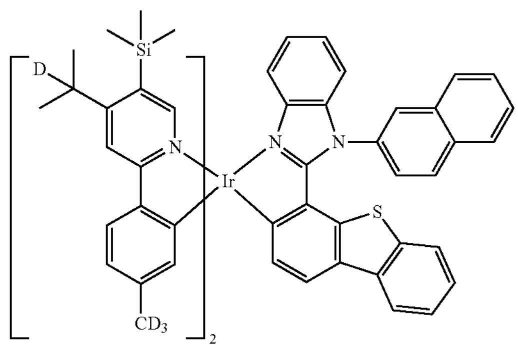
2372
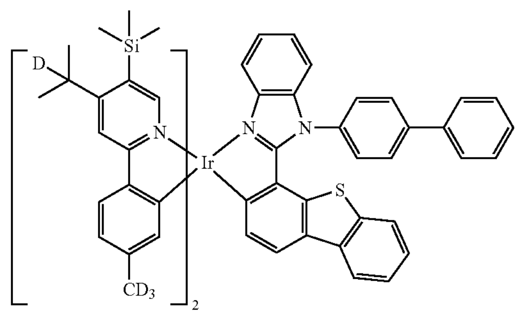
2373
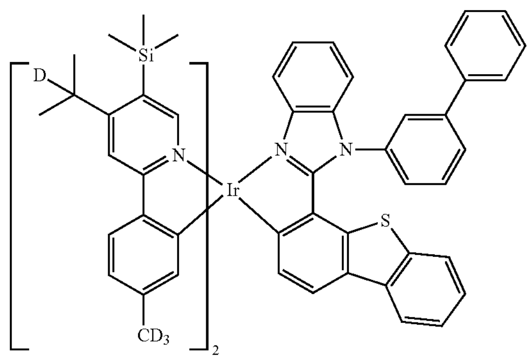
2374
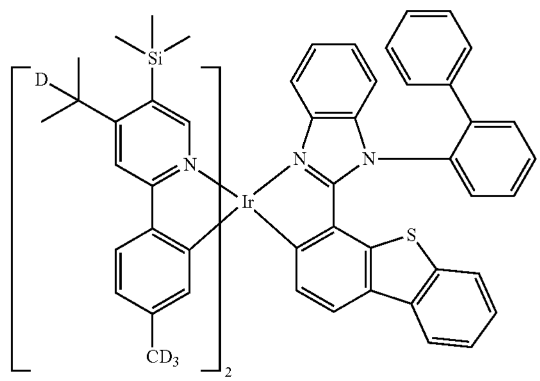

-continued
2375
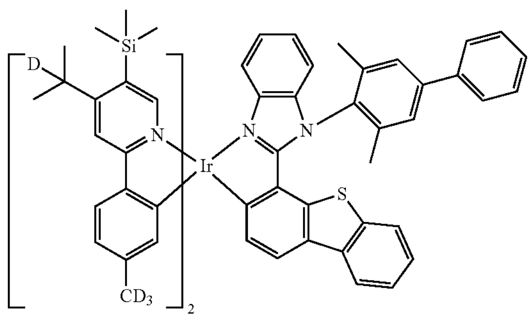
2376
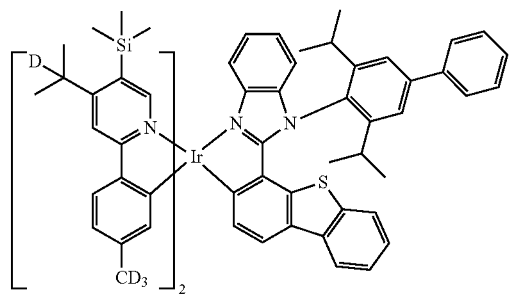
2377
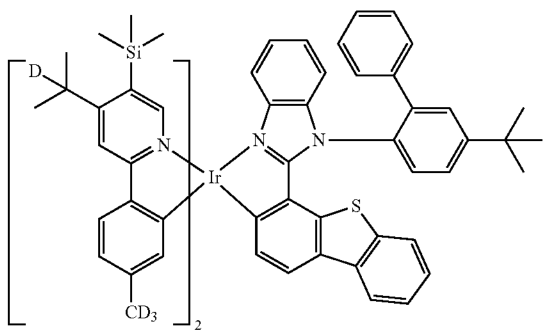
2378
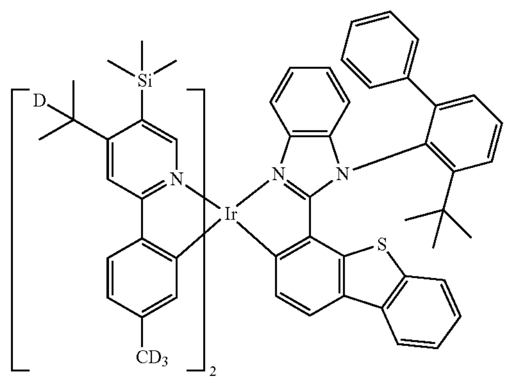
2379
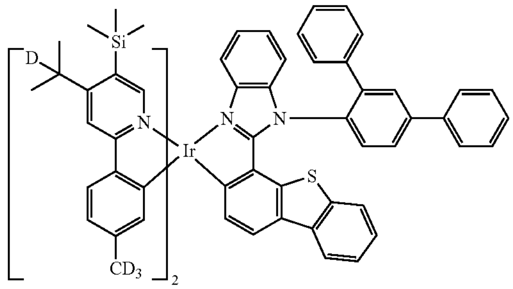
2380
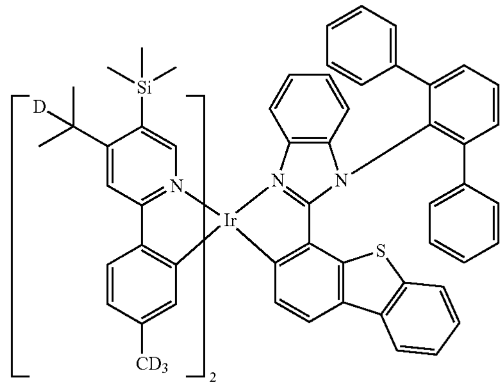
2381
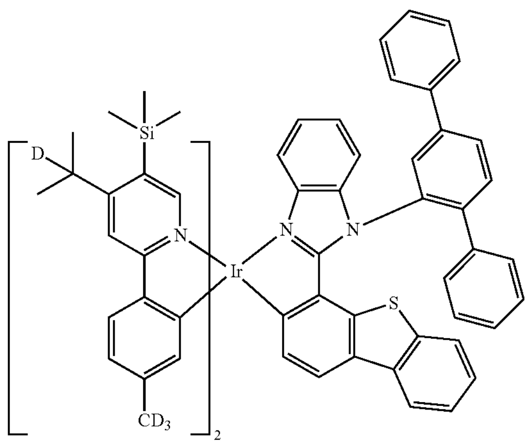
2382
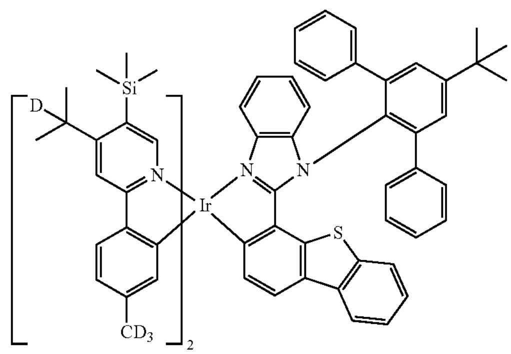

-continued
2383
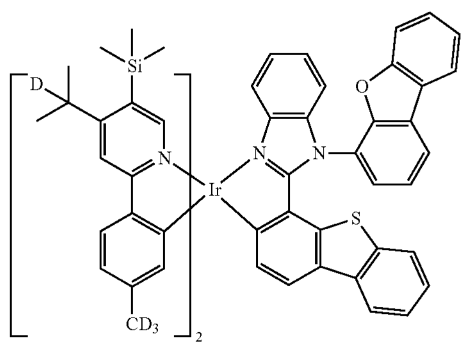
2384
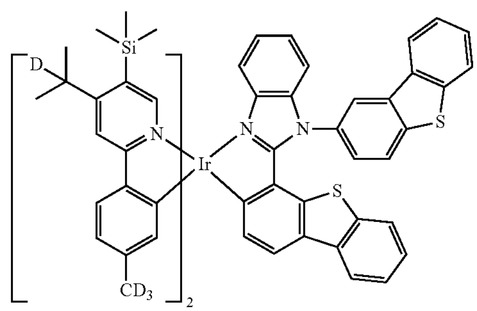
2385
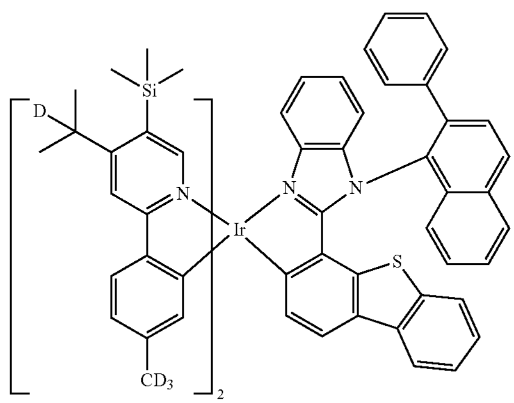
2386
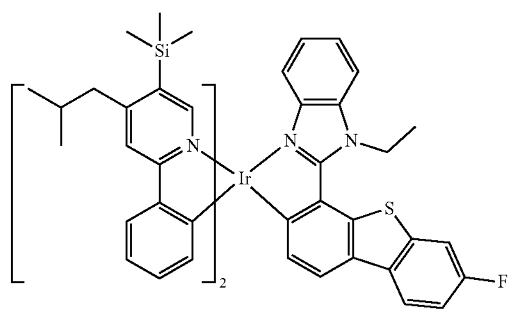
2387
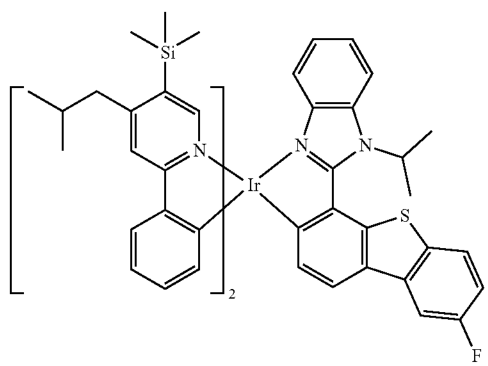
2388
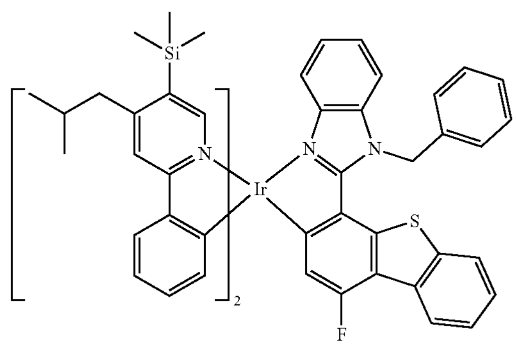
2389
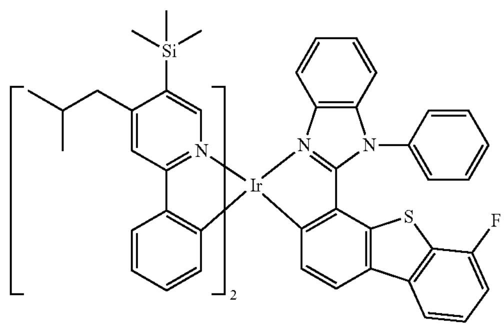
2390
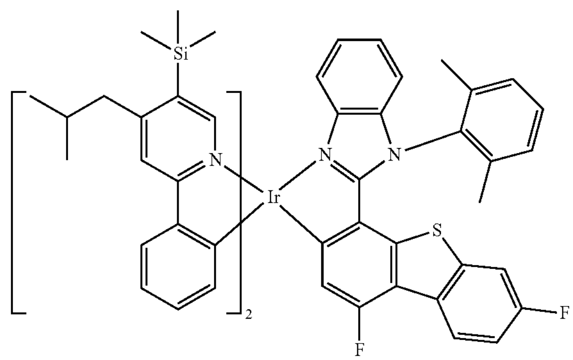

-continued
2391
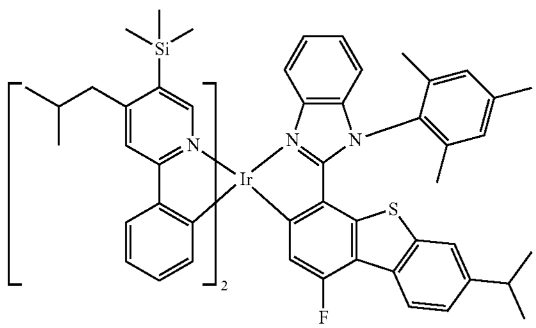
2392
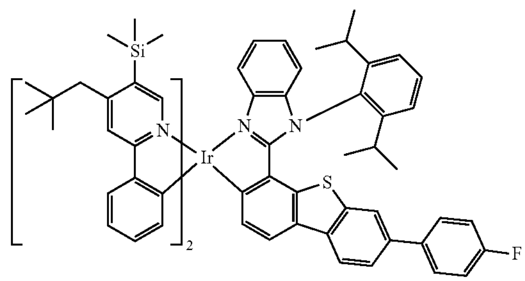
2393
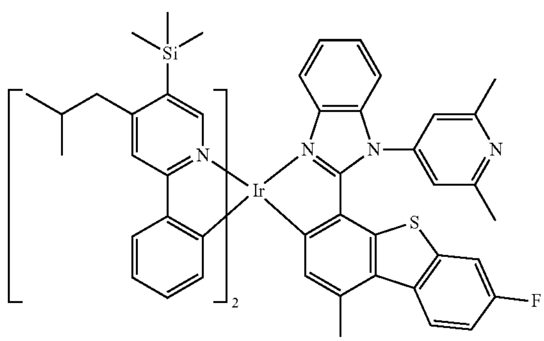
2394
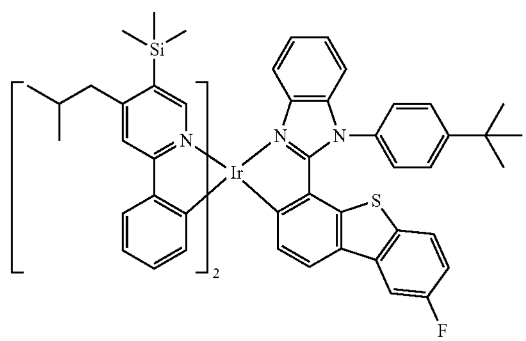
2395
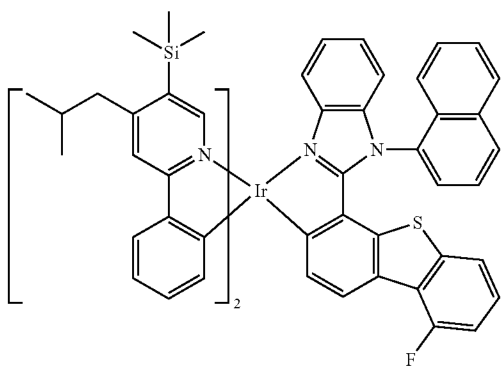
2396
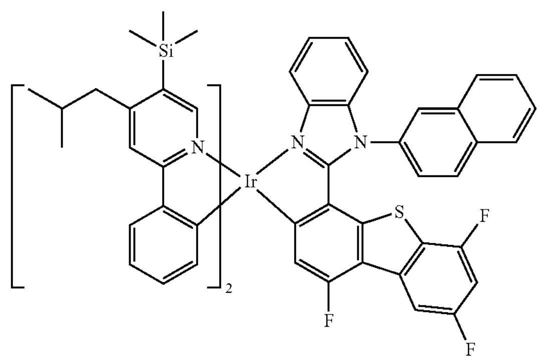
2397
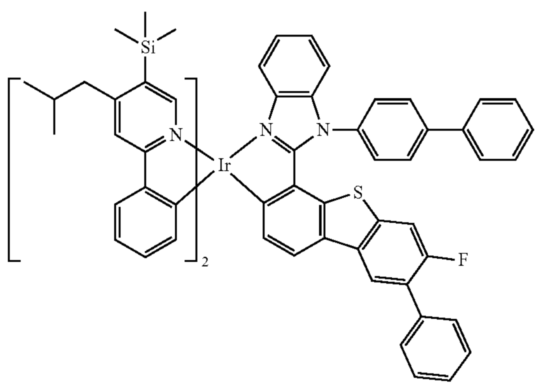
2398
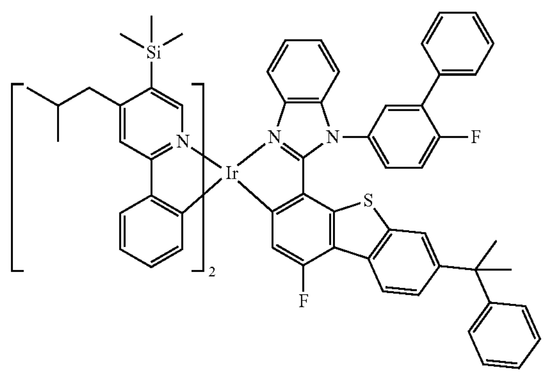

-continued
2399
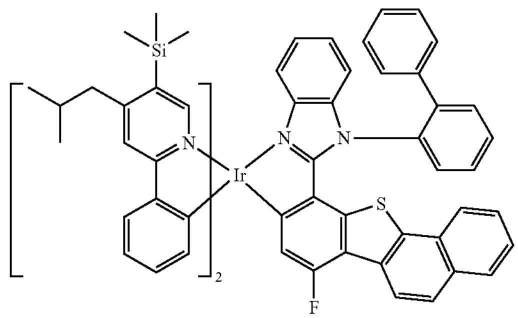
2400
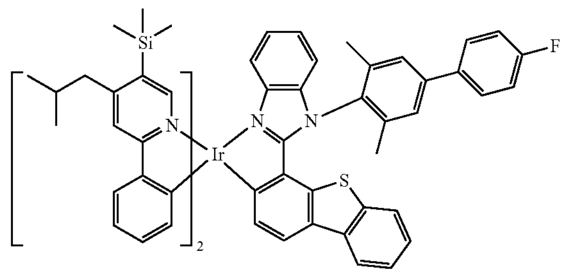
2401
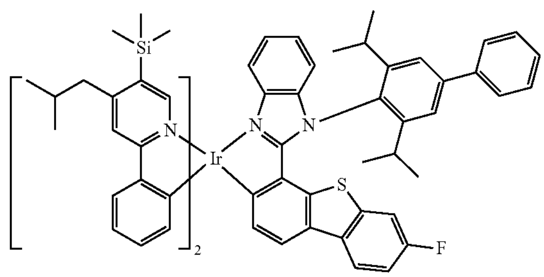
2402
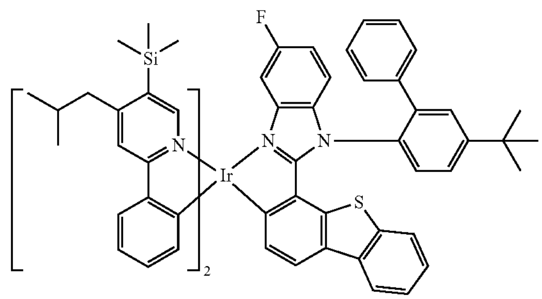
2403
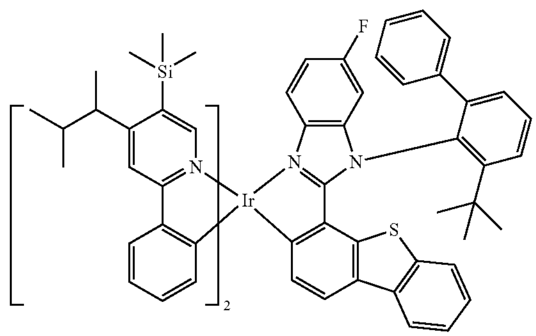
2404
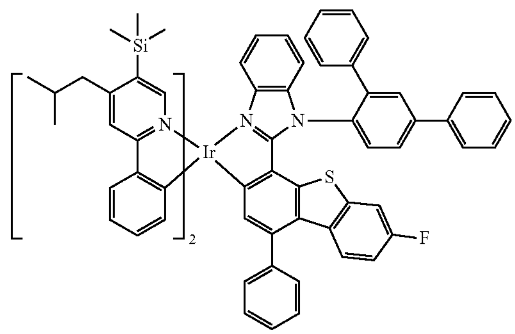
2405
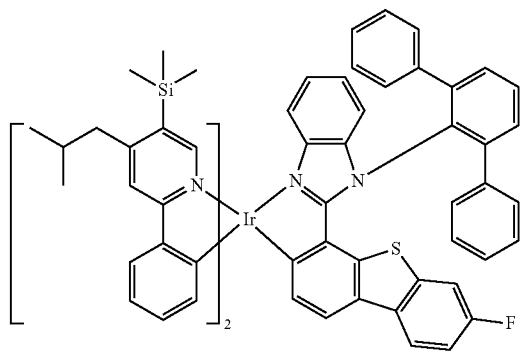
2406
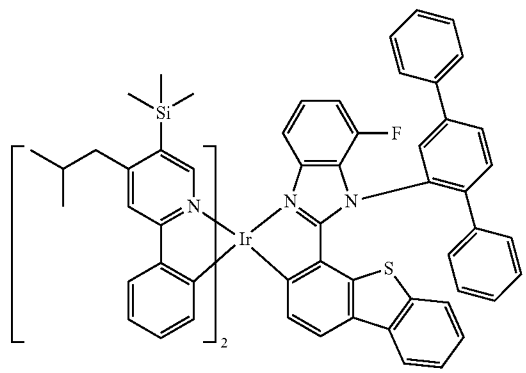

-continued
2407
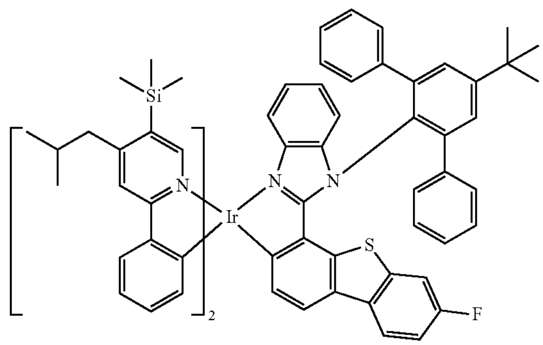
2408
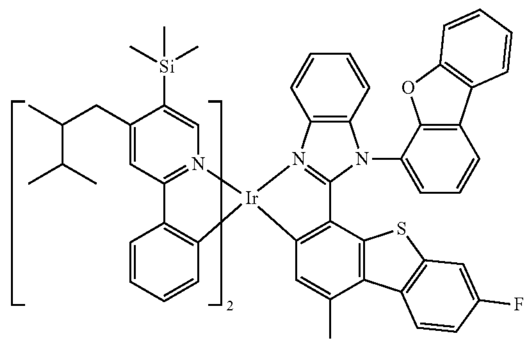
2409
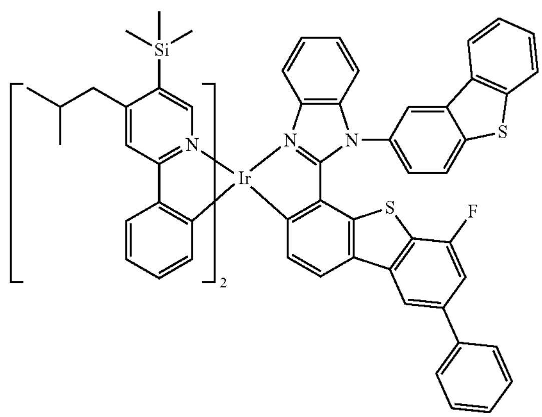
2410
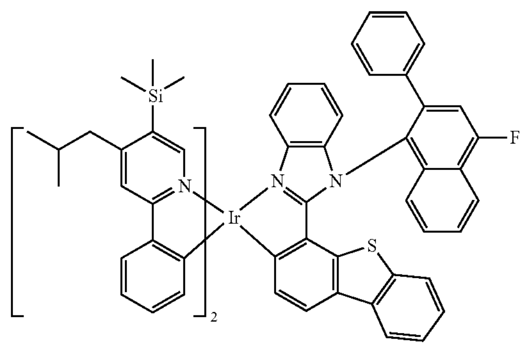
2411
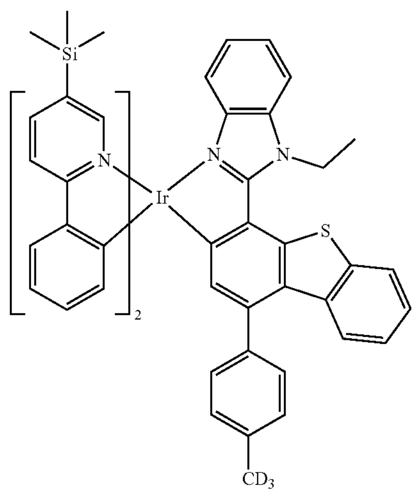
2412
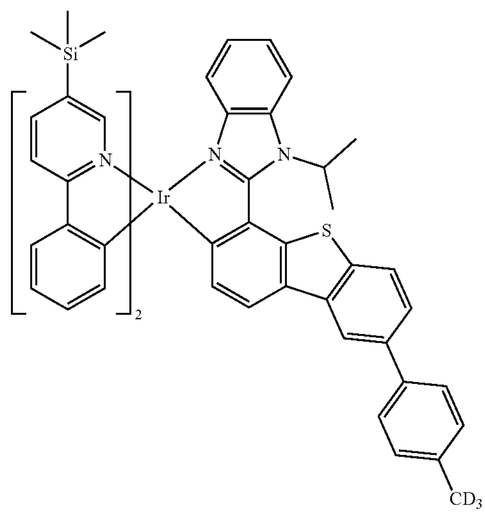

-continued
2413
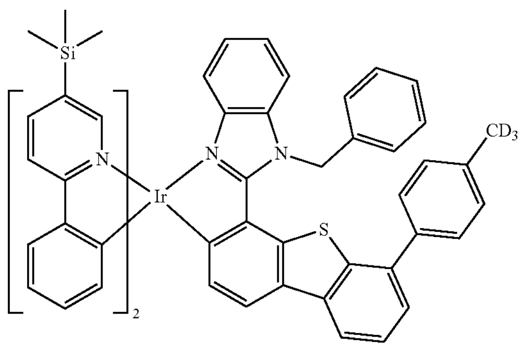
2414
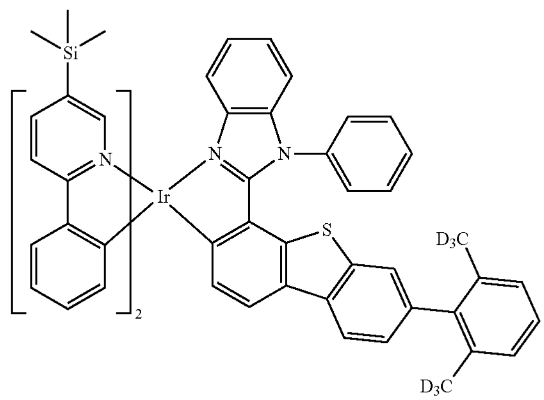
2415
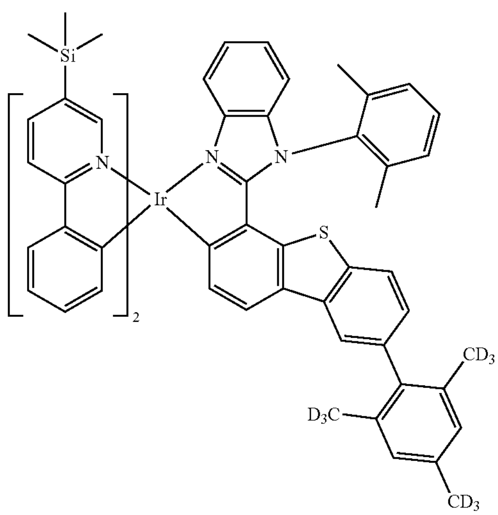
2416
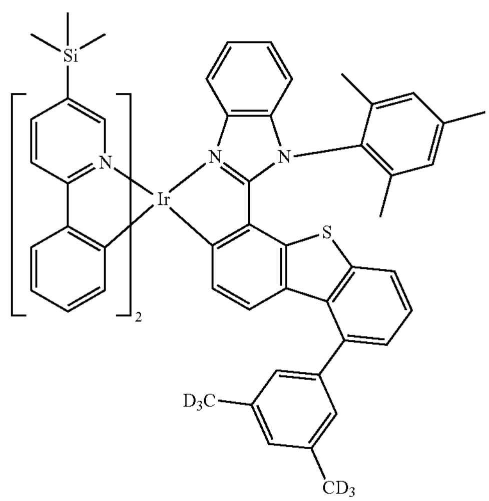
2417
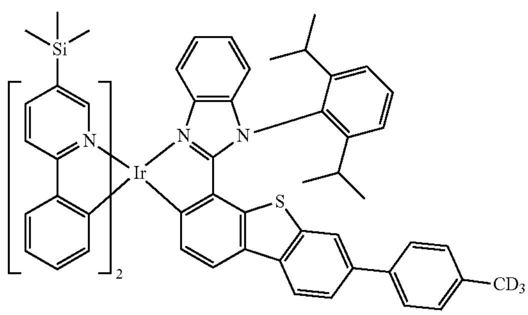
2418
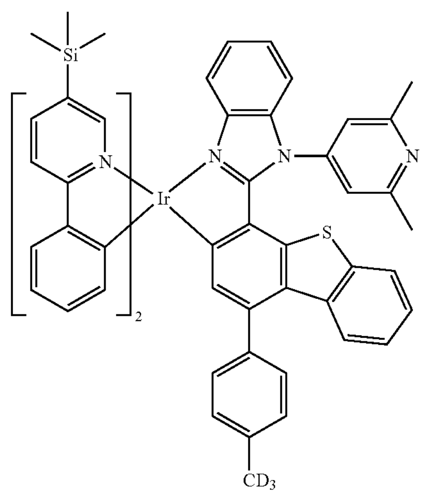

-continued
2419
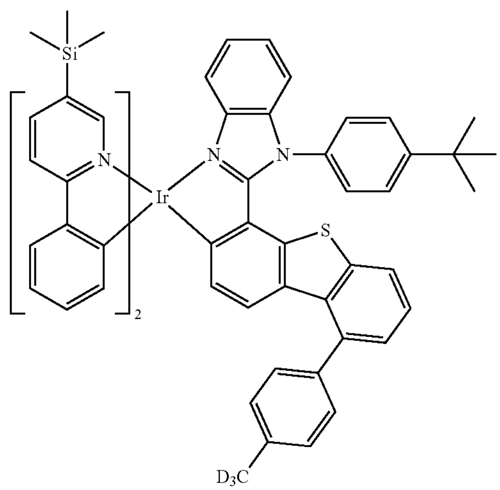
2420
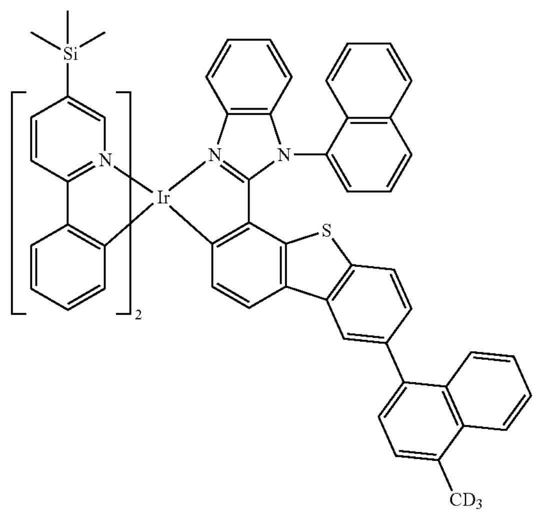
2421
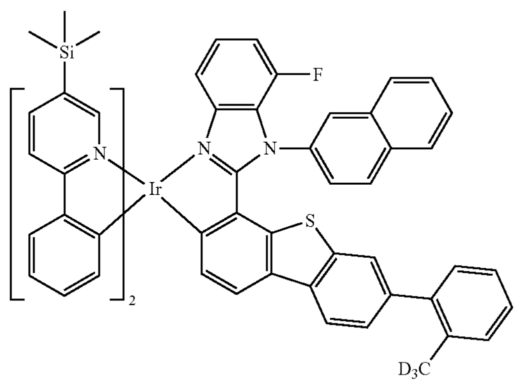
2422
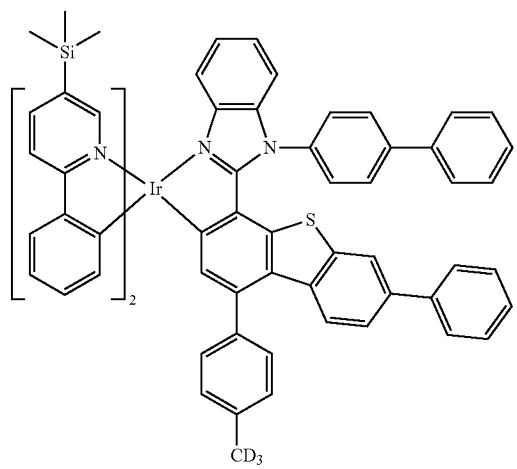
2423
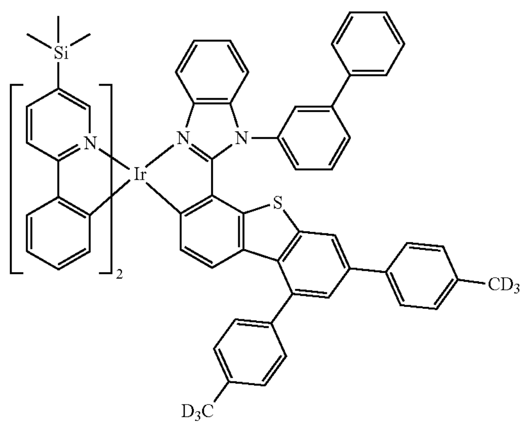
2424
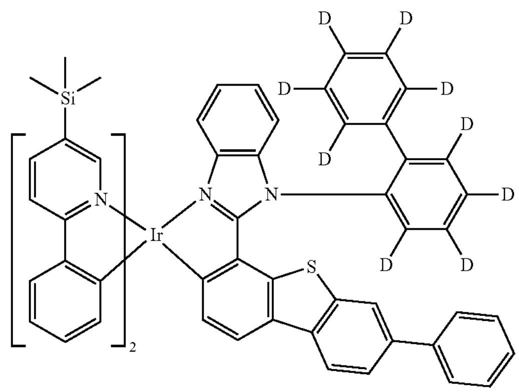

-continued
2425
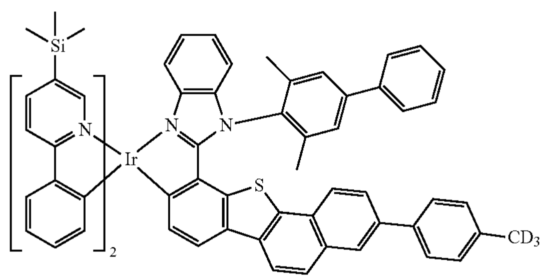
2426
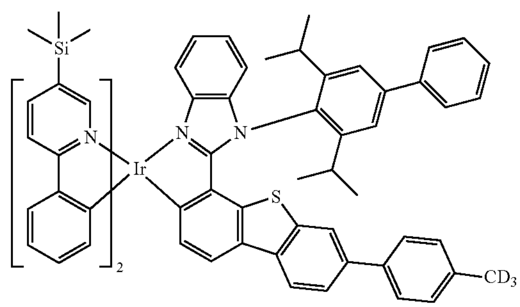
2427
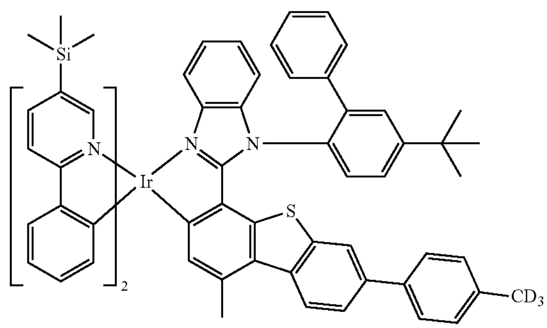
2428
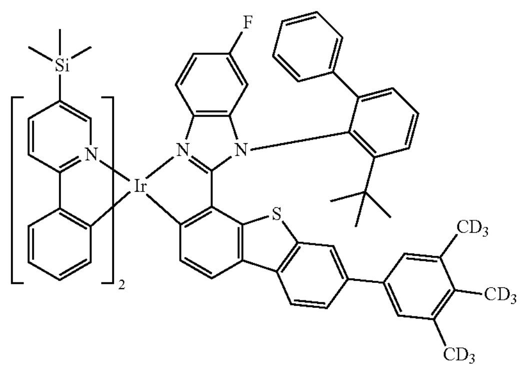
2429
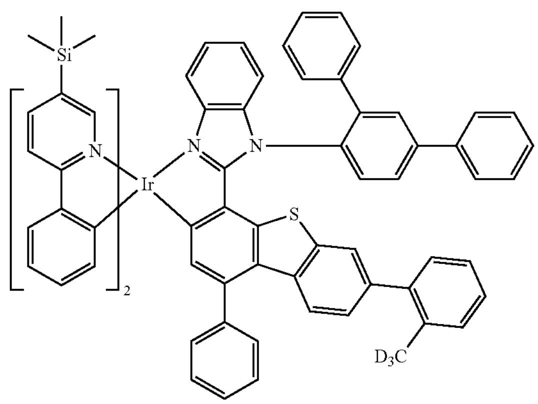
2430
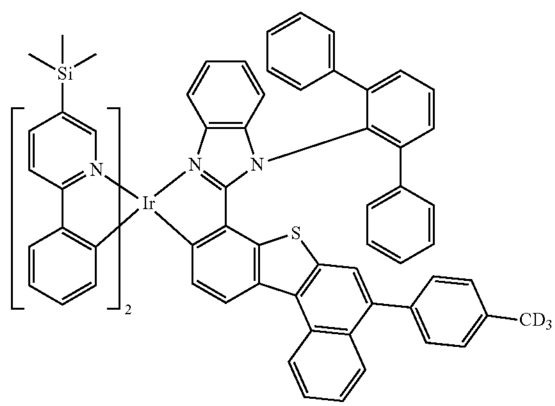

-continued
2431
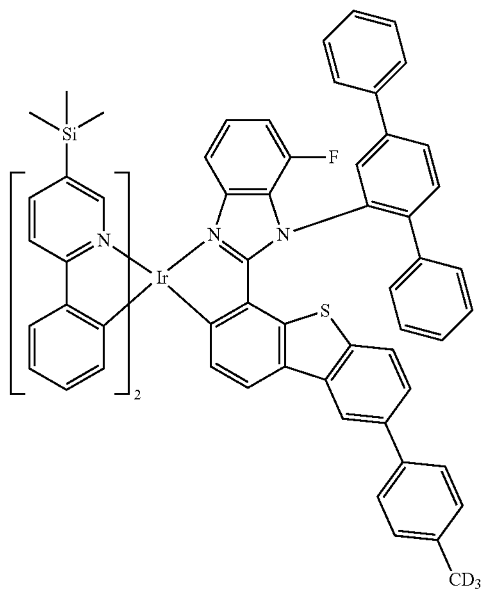
2432
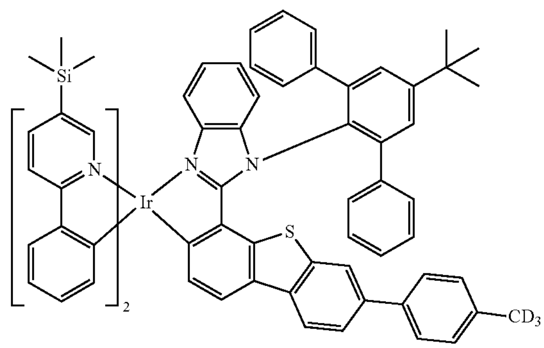
2433
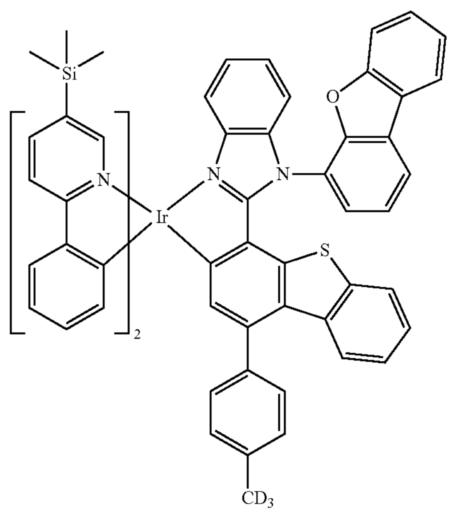
2434
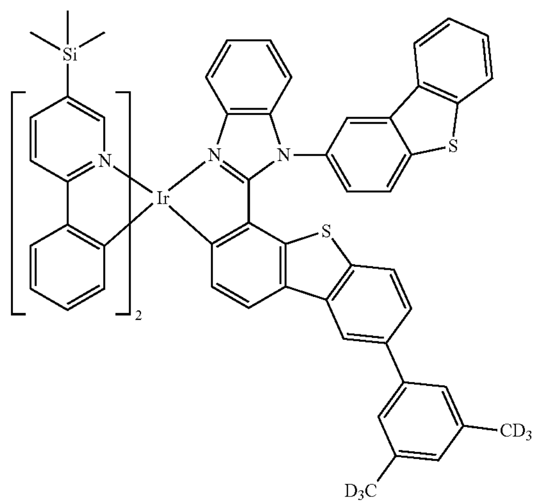
2435
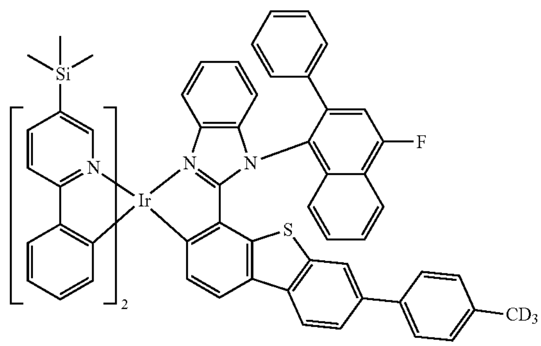
2436
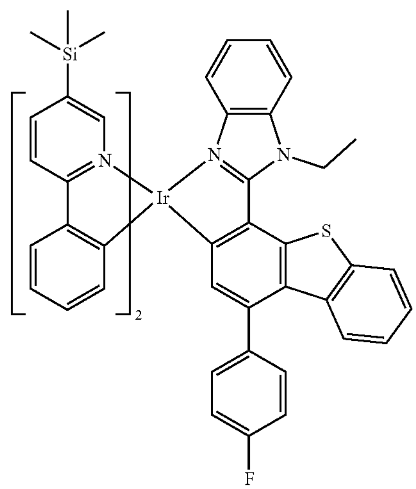

-continued
2437
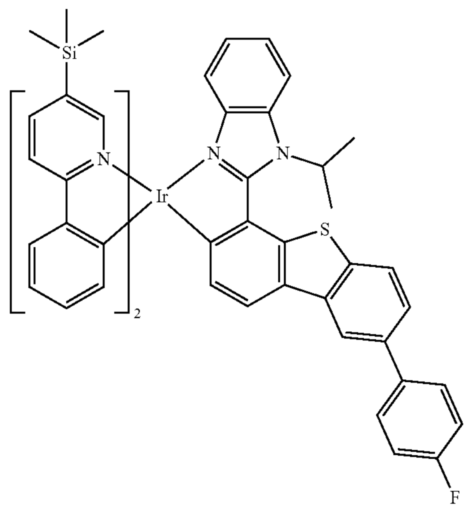
2438
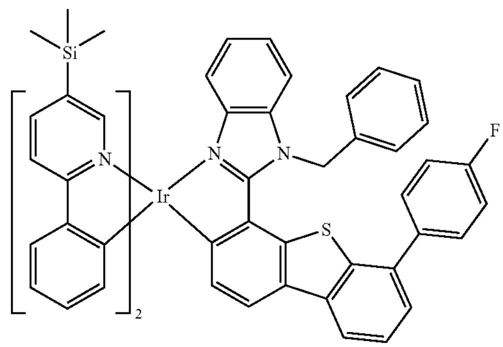
2439
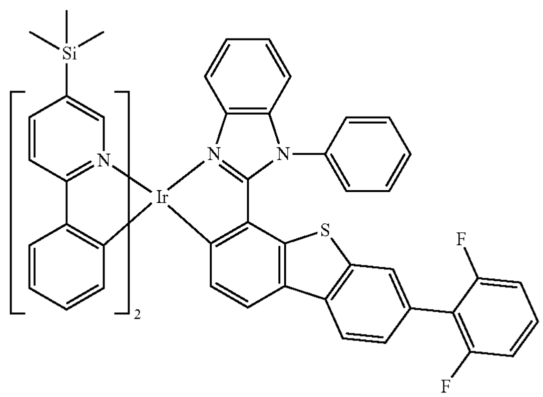
2440
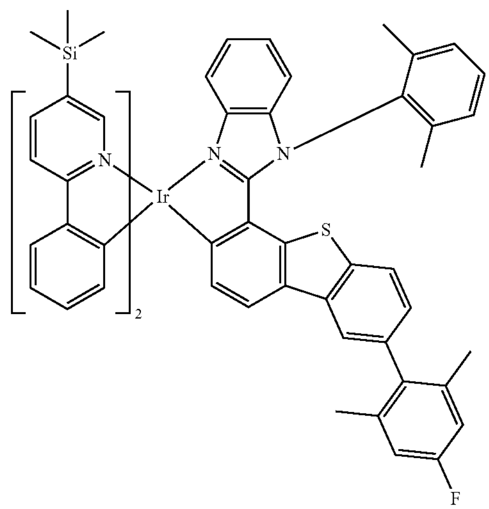
2441
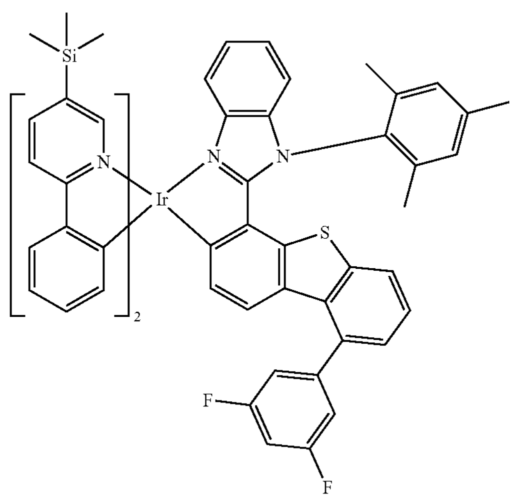
2442
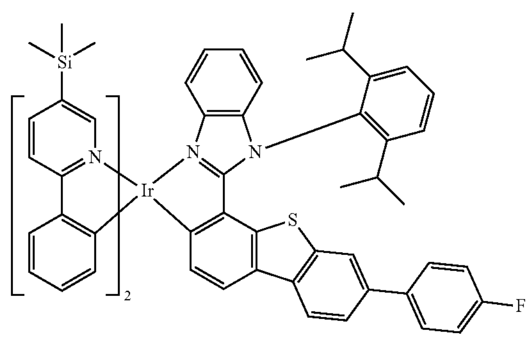

-continued
2443
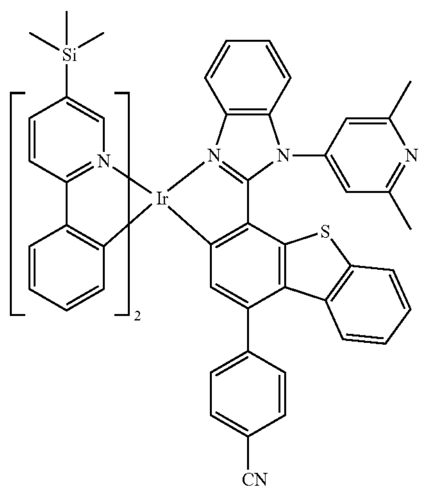
2444
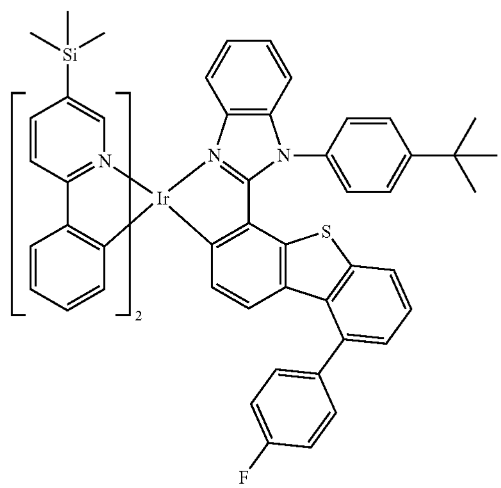
2445
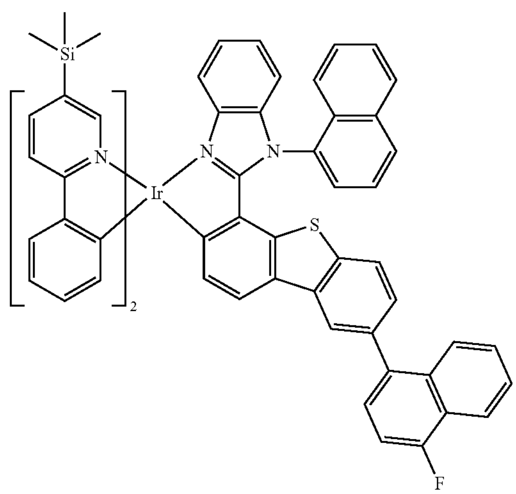
2446
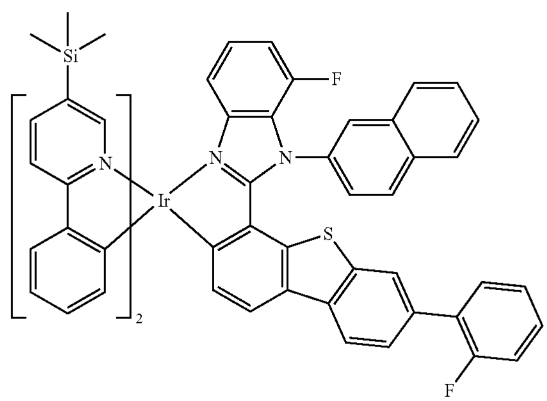
2447
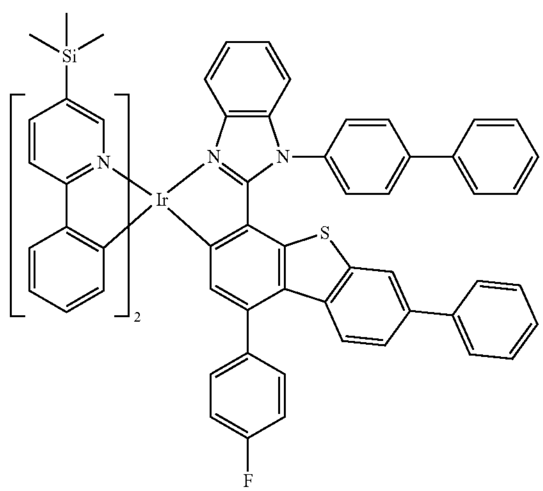
2448
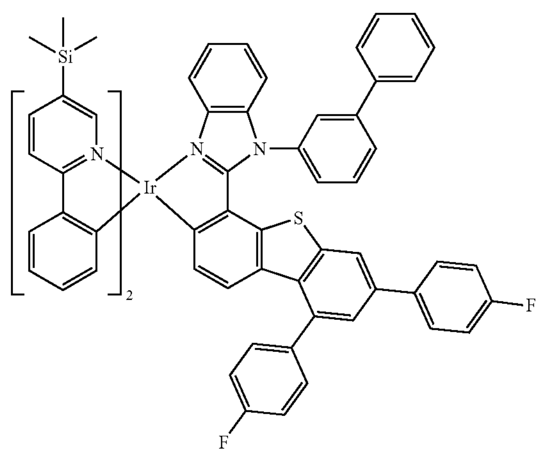

-continued
2449
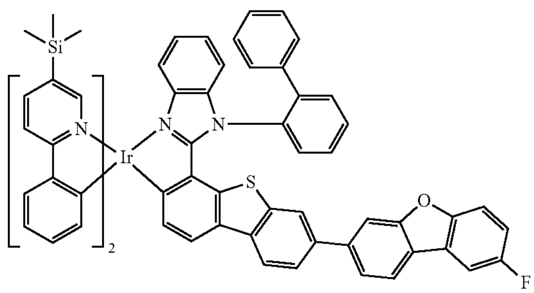
2450
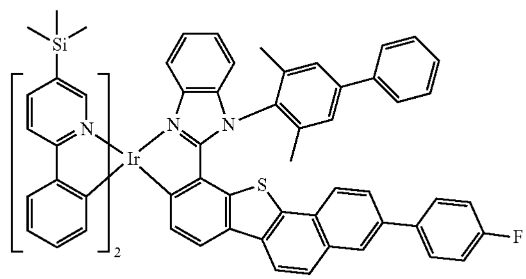
2451
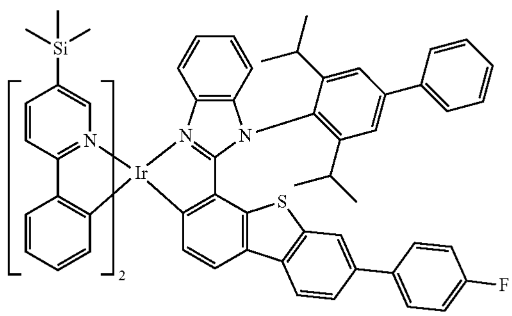
2452
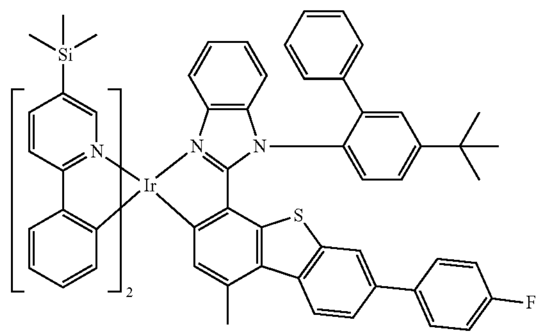
2453
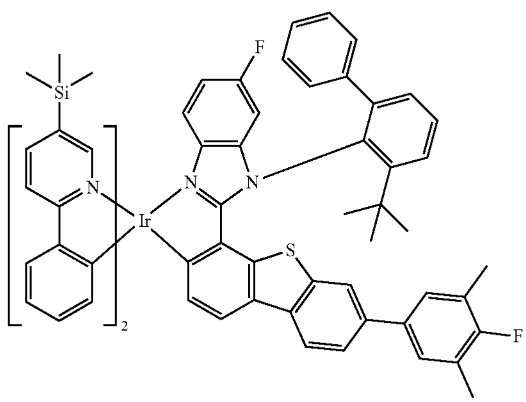
2454
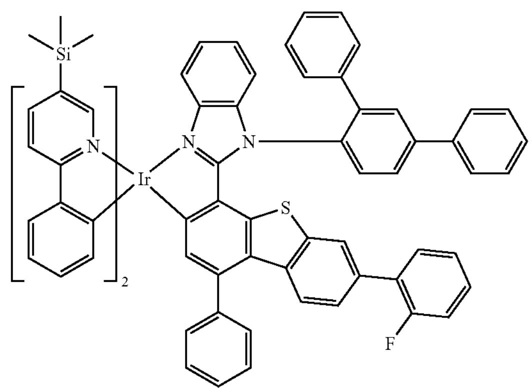

-continued
2455
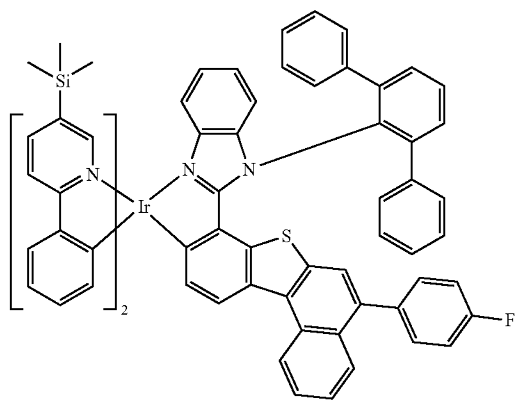
2456
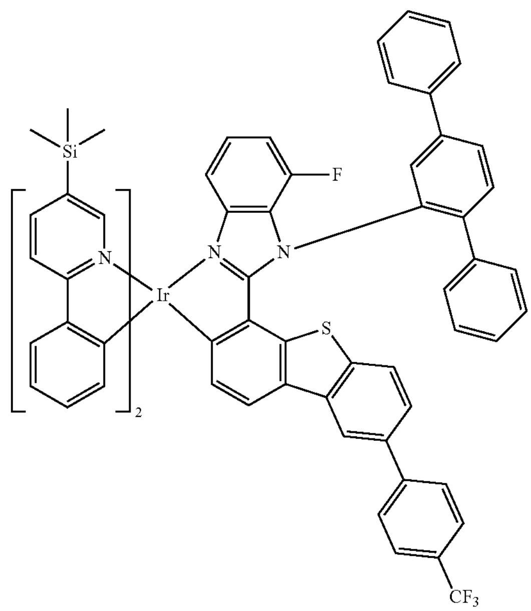
2457
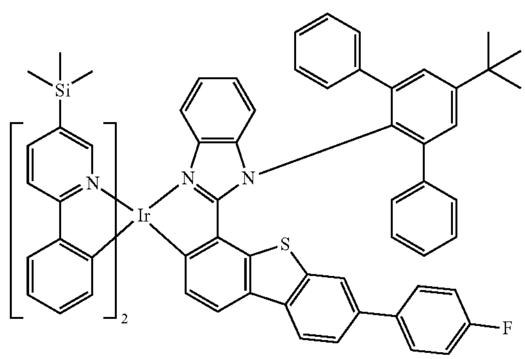
2458
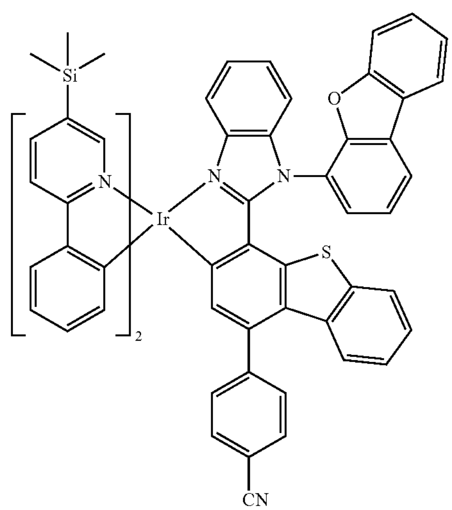
2459
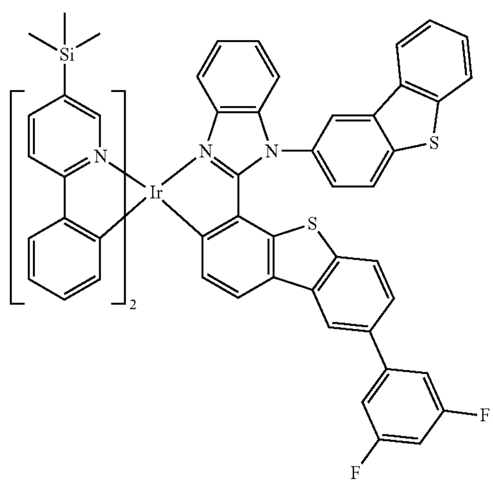
2460
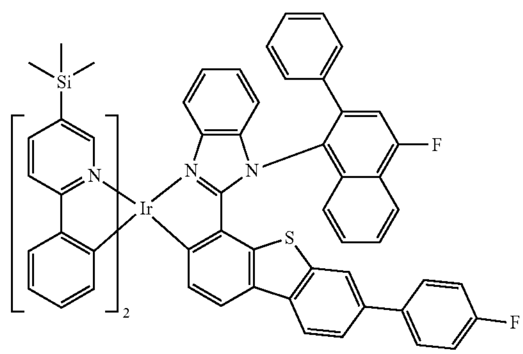

-continued
2461
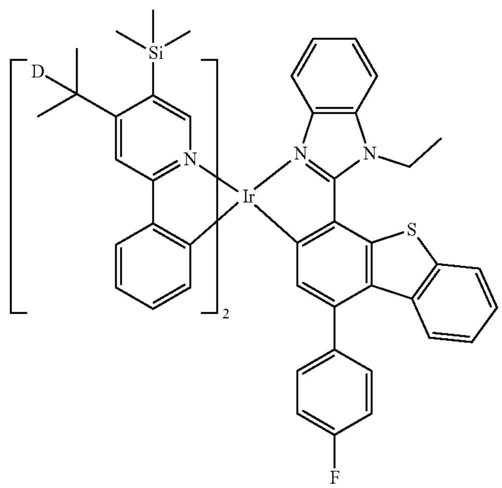
2462
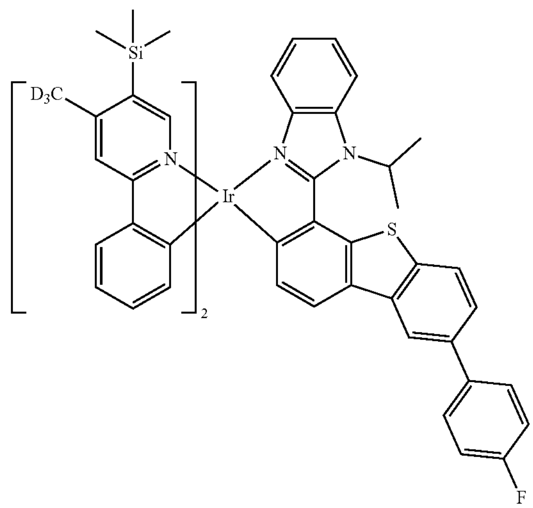
2463
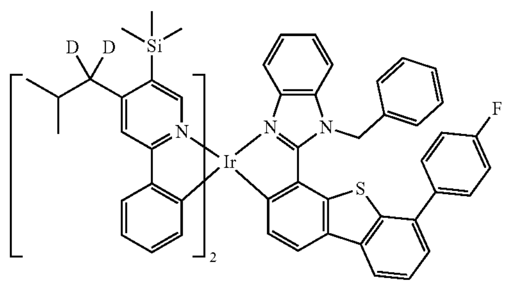
2464
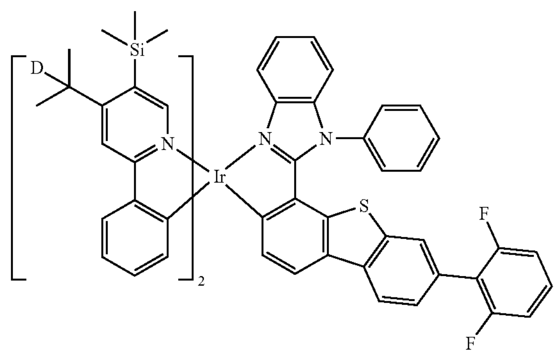
2465
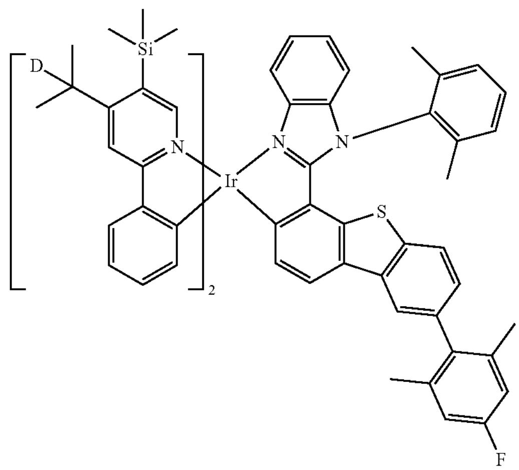
2466
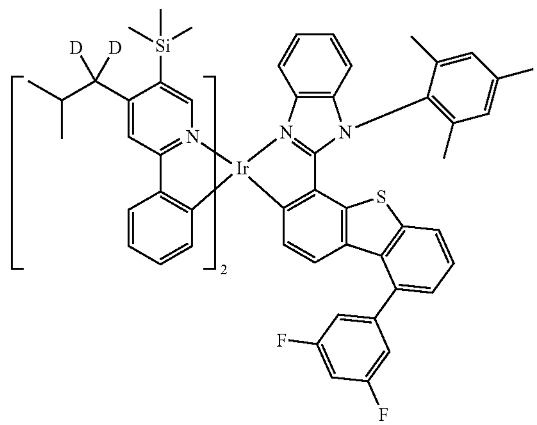

-continued
2467
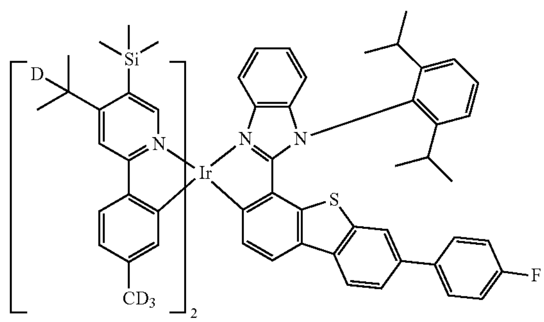
2468
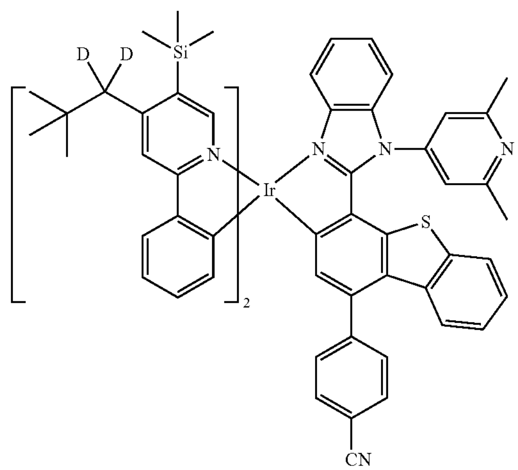
2469
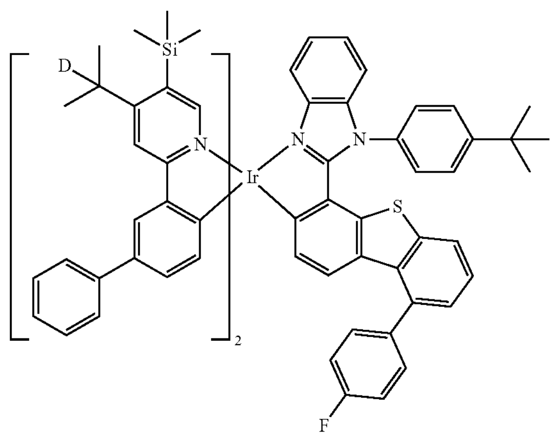
2470
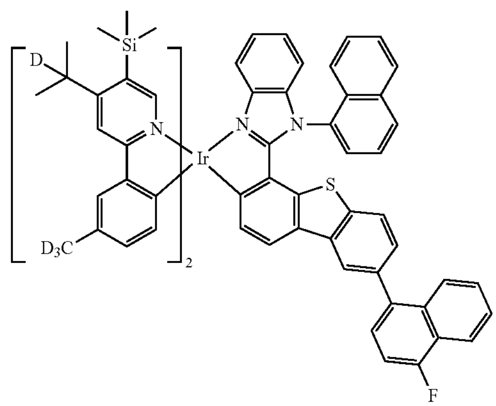
2471
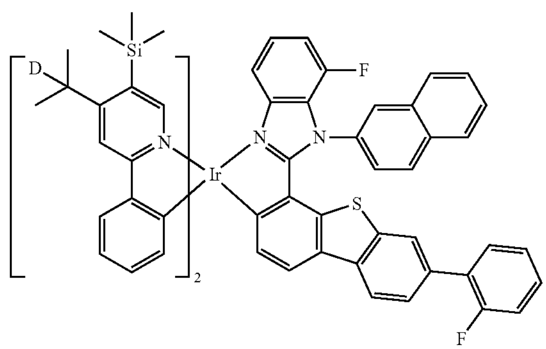
2472
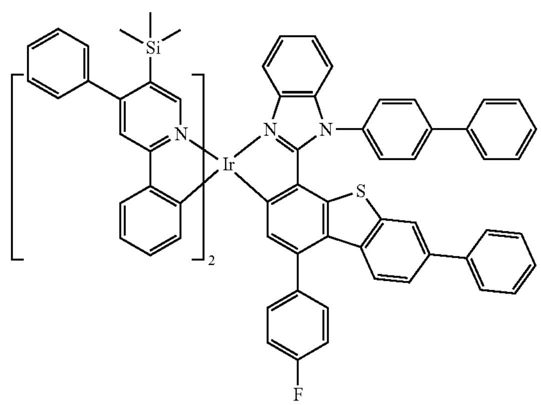

-continued
2473
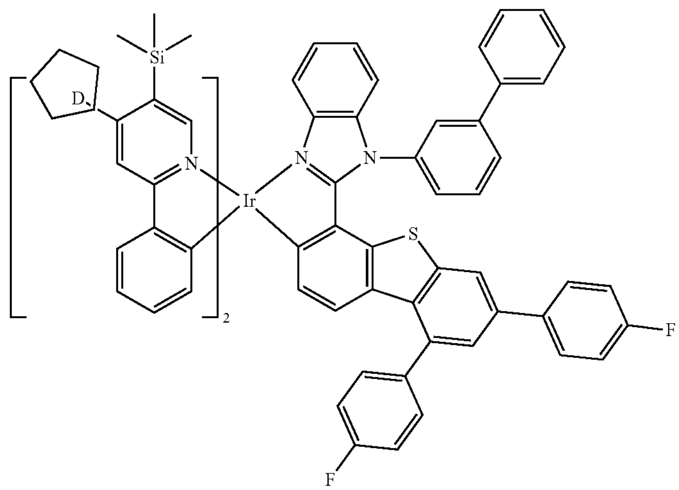
2474
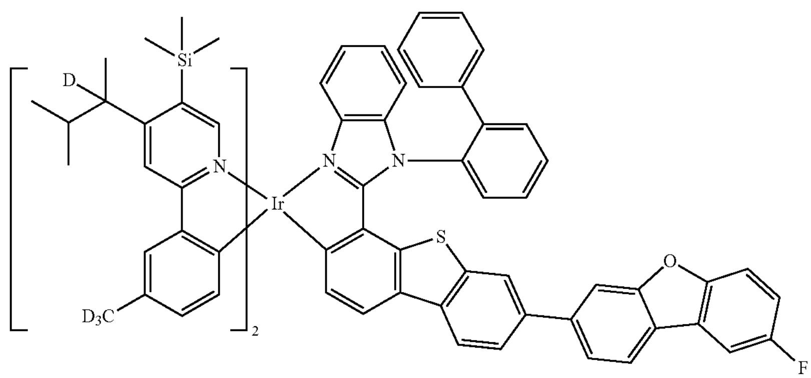
2475
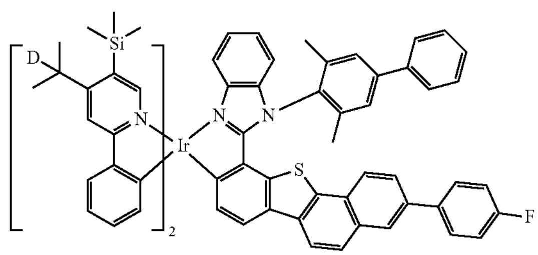
2476
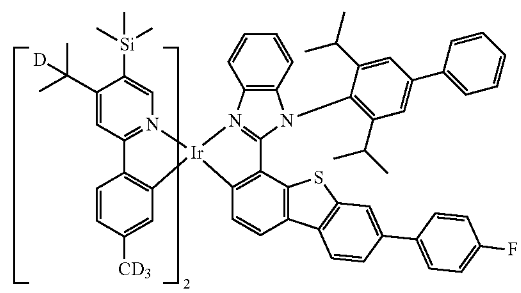
2477
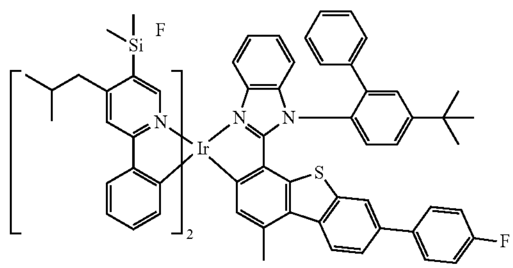
2478
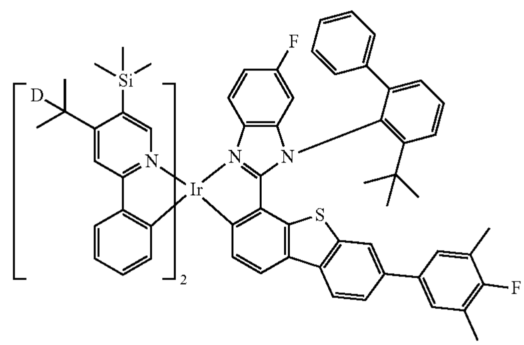

-continued
2479
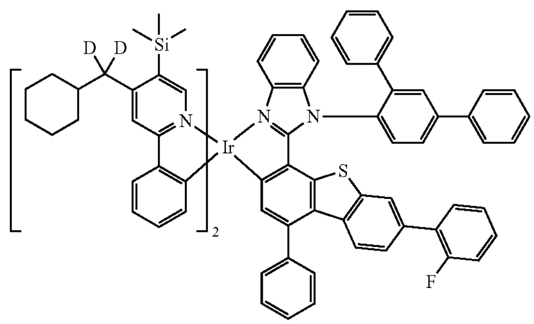
2480
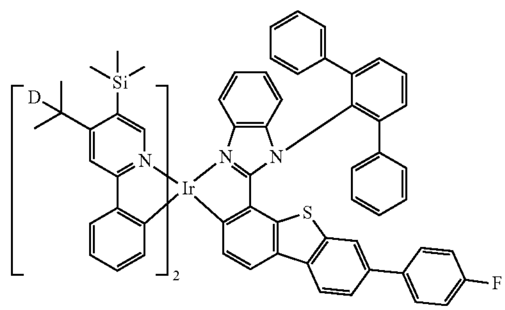
2481
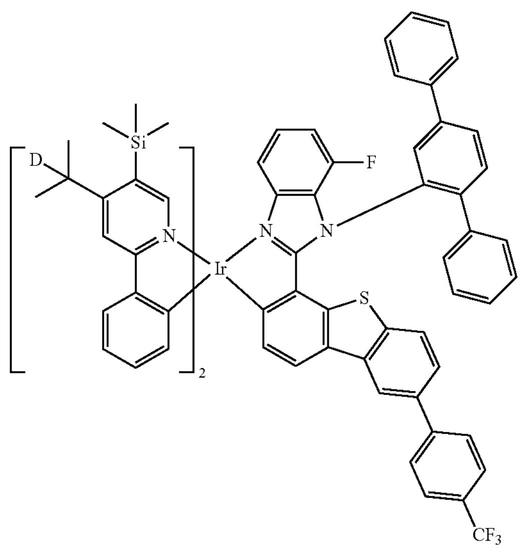
2482
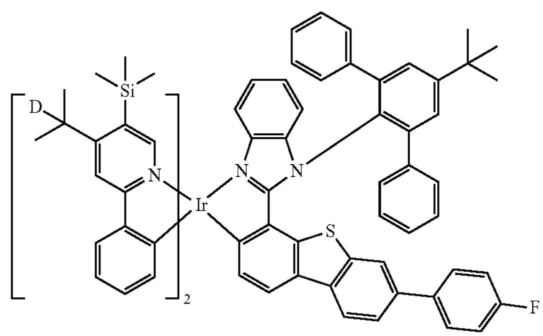
2483
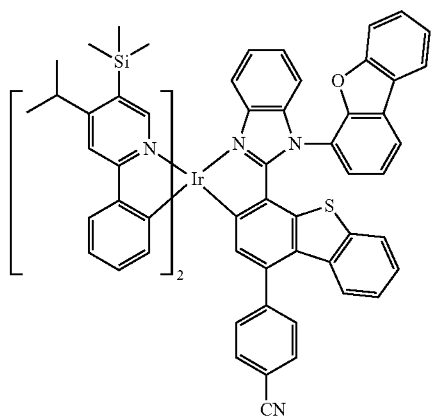
2484
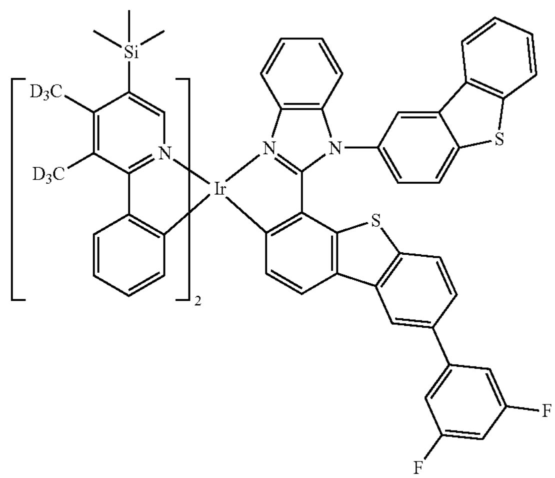

-continued
2485
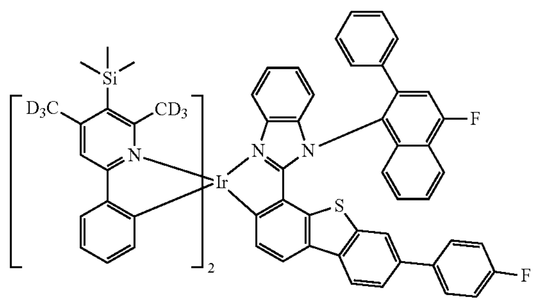
2486
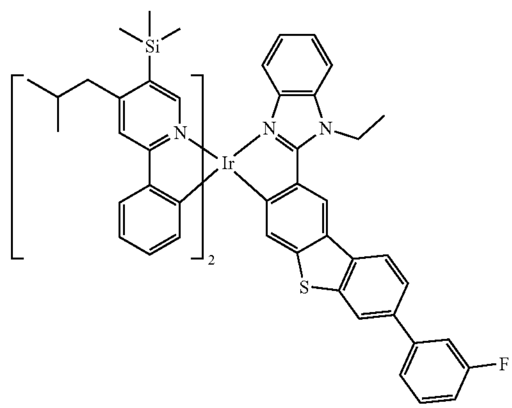
2487
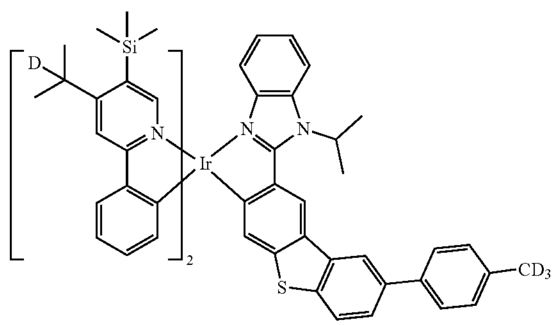
2488
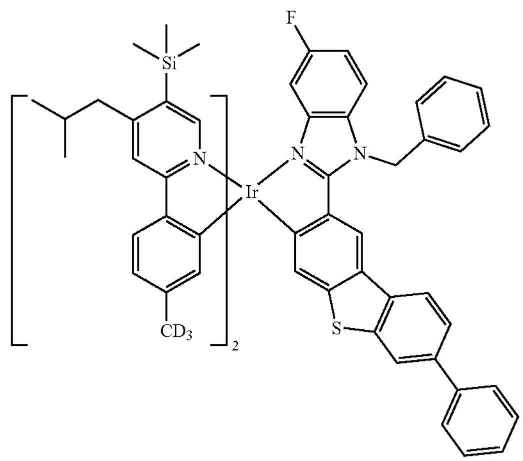
2489
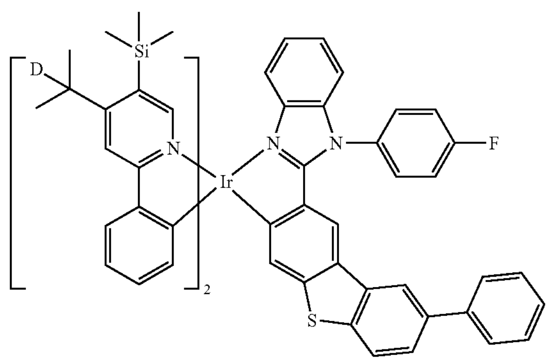
2490
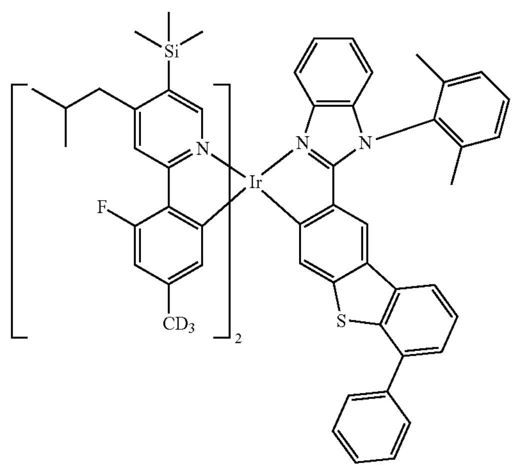

-continued
2491
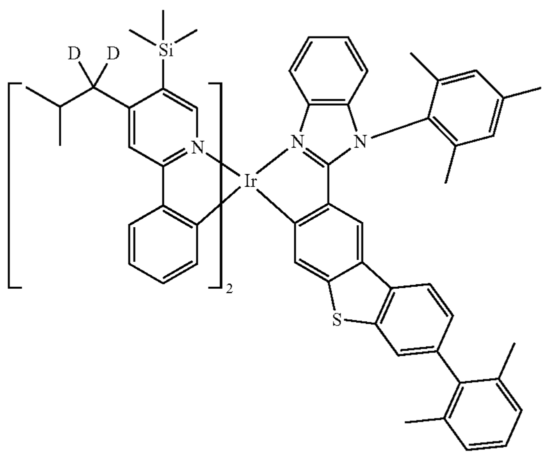
2492
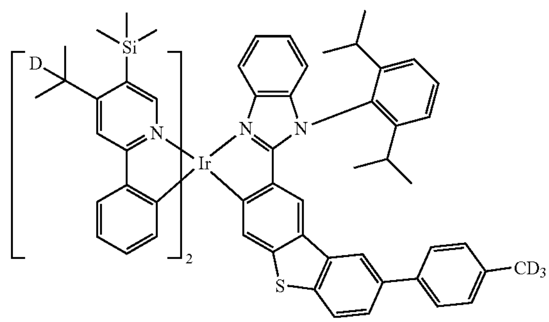
2493
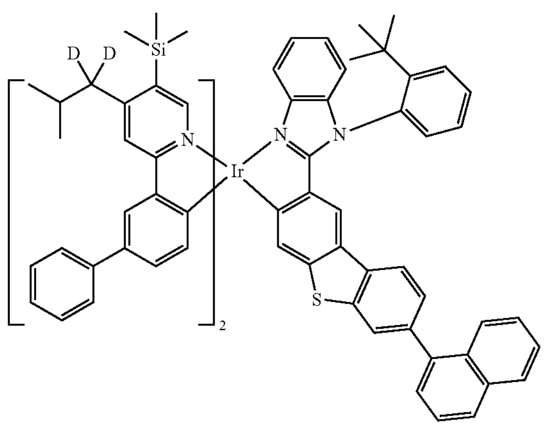
2494
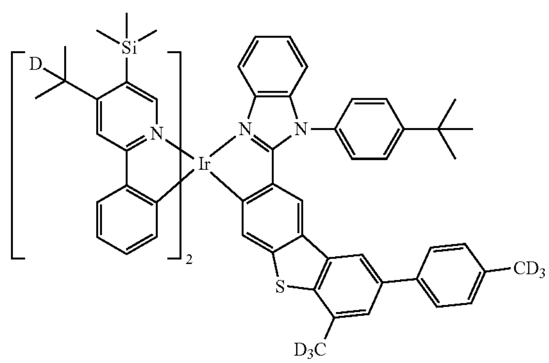
2495
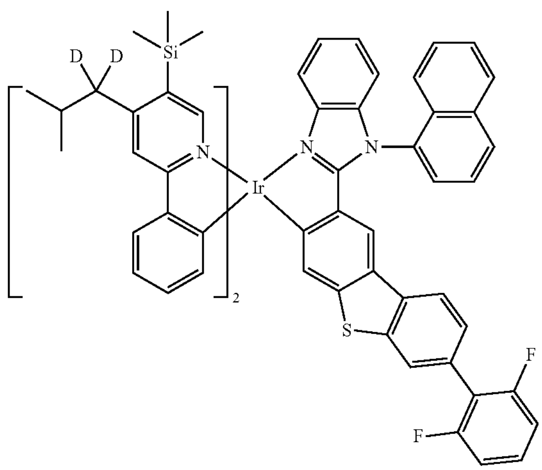
2496
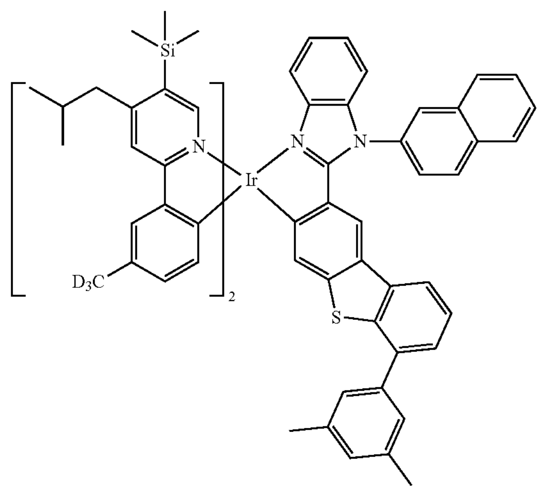

-continued
2497
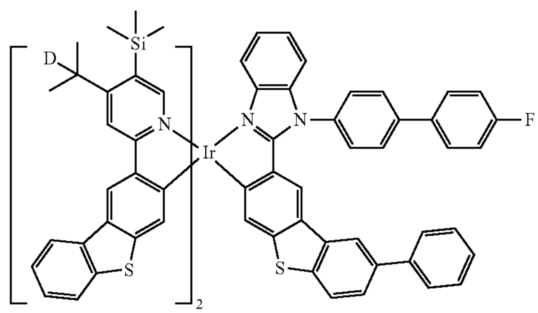
2498
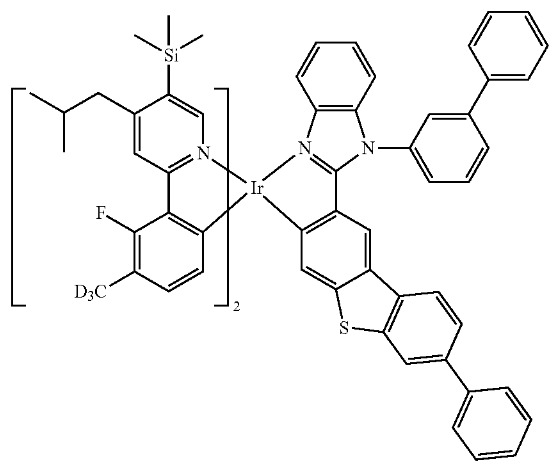
2499
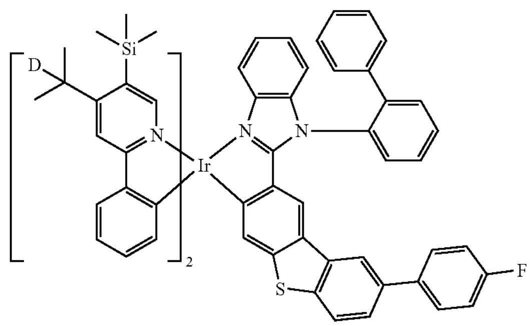
2500
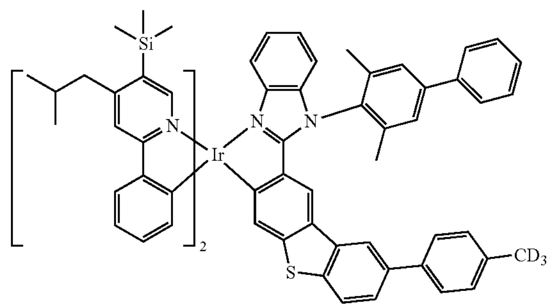
2501
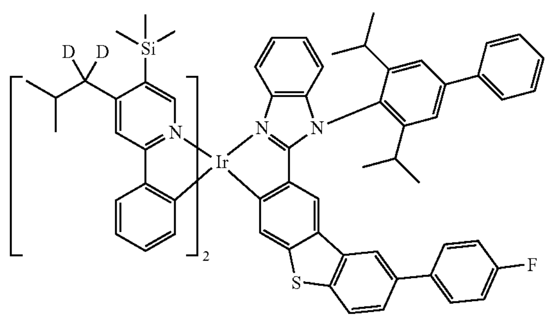
2502
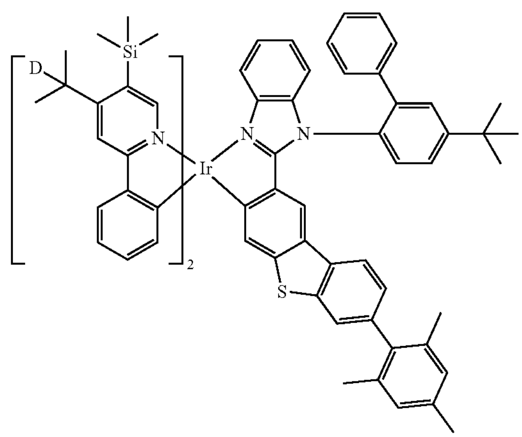

-continued
2503
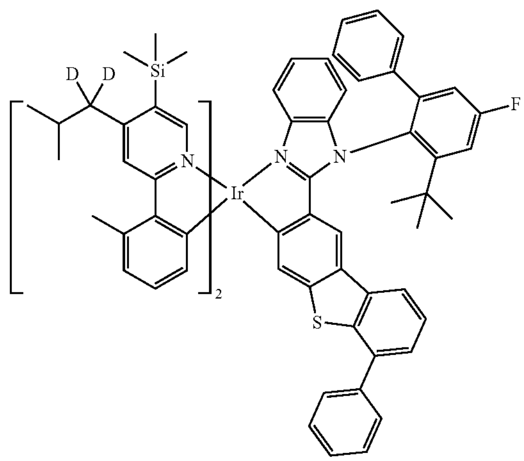
2504
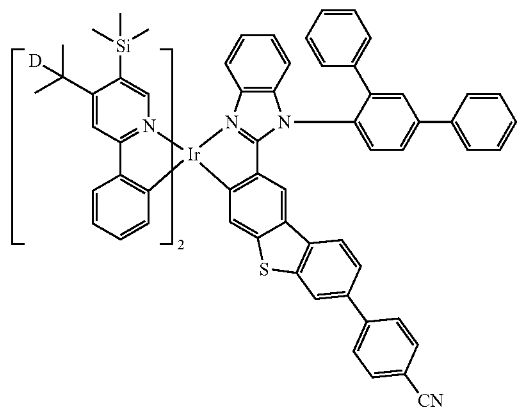
2505
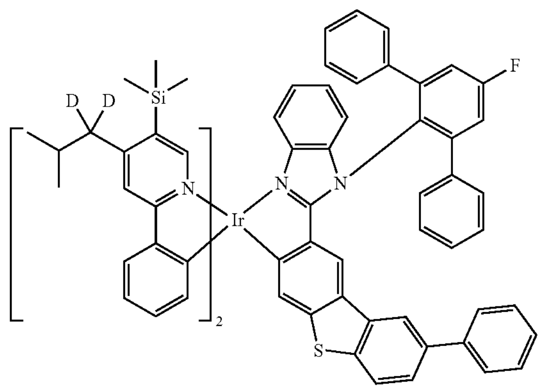
2506
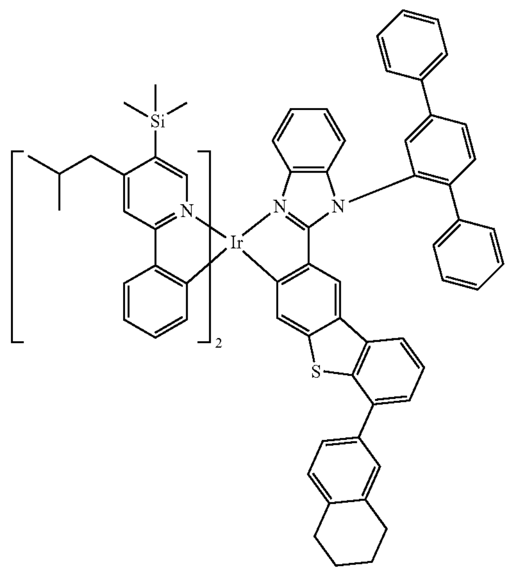
2507
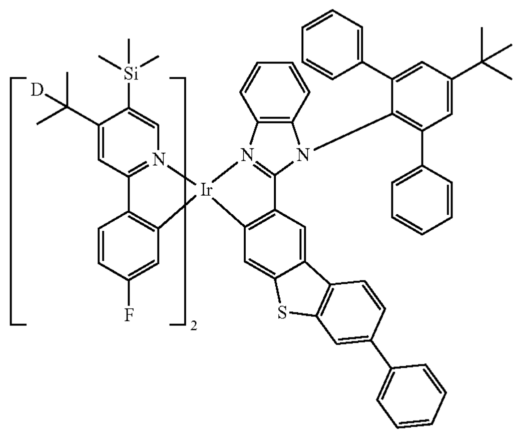
2508
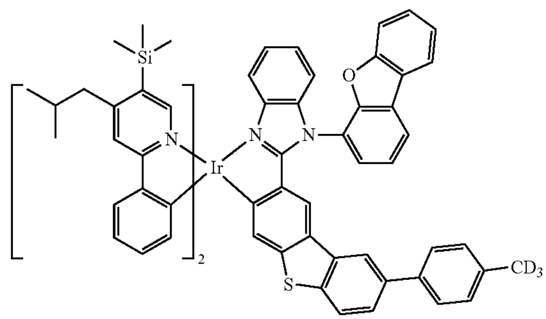

-continued
2509
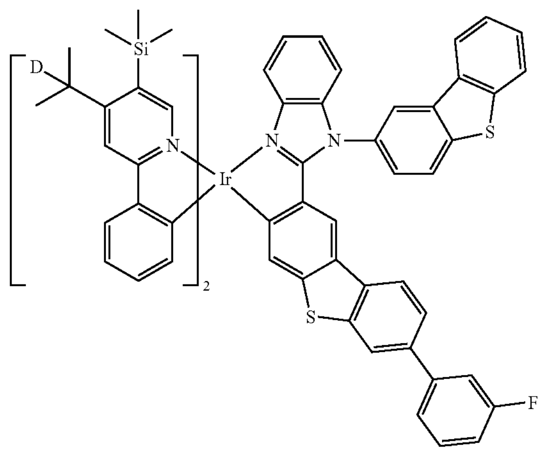
2510
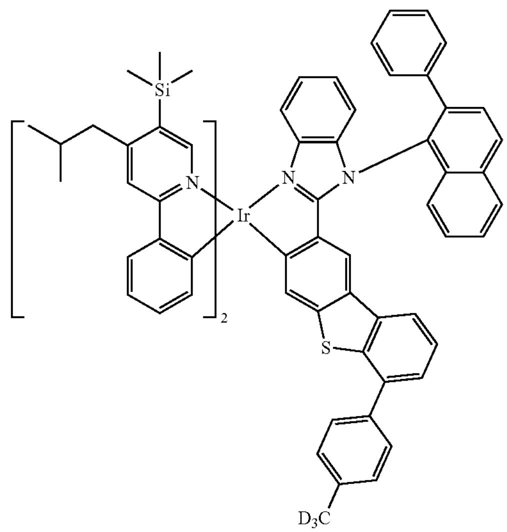
2511
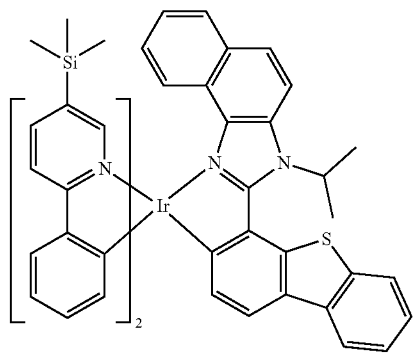
2512
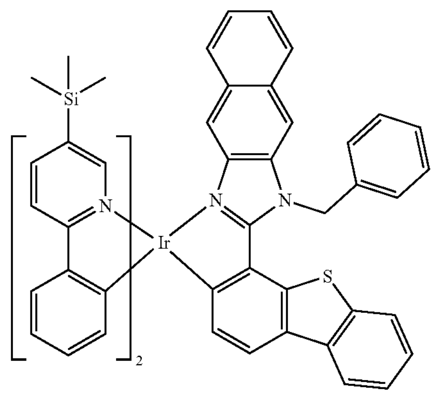
2513
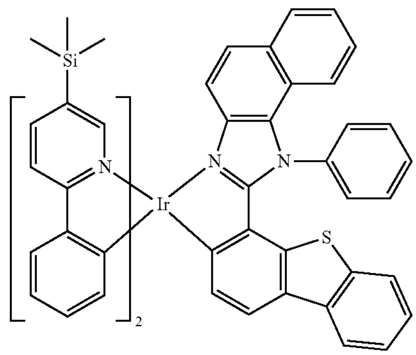
2514
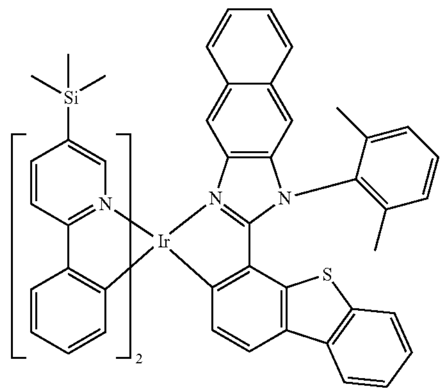

-continued
2515
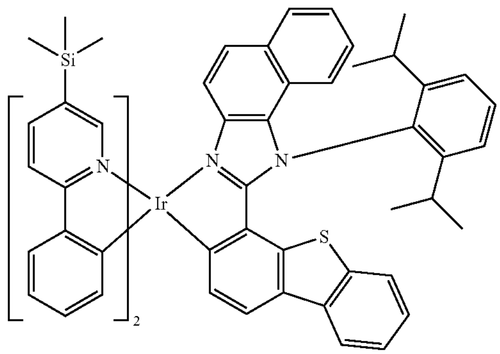
2516
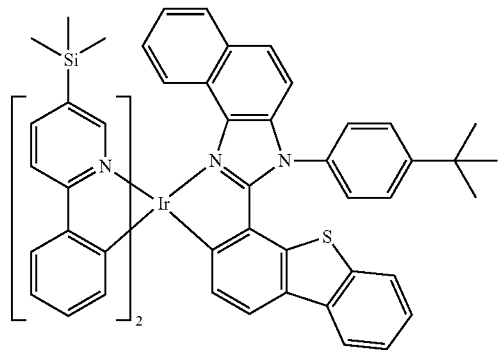
2517
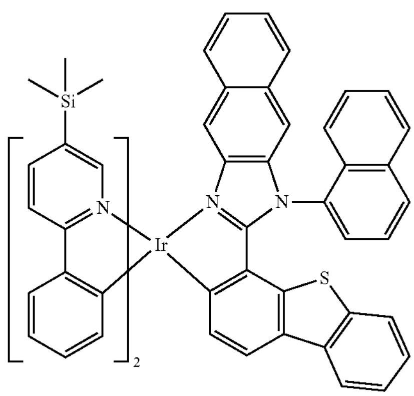
2518
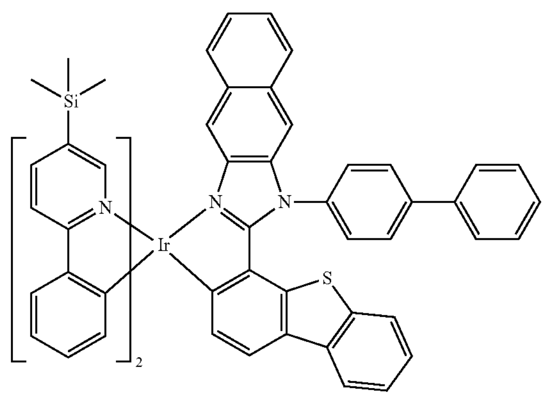
2519
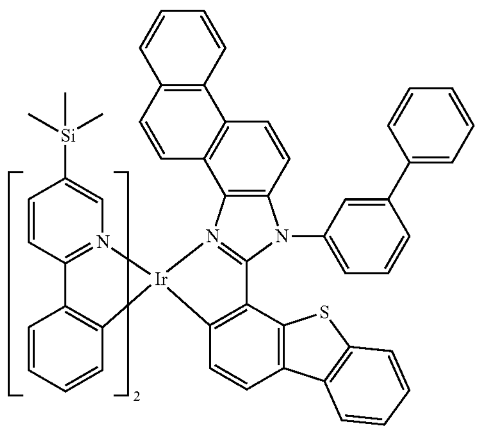
2520
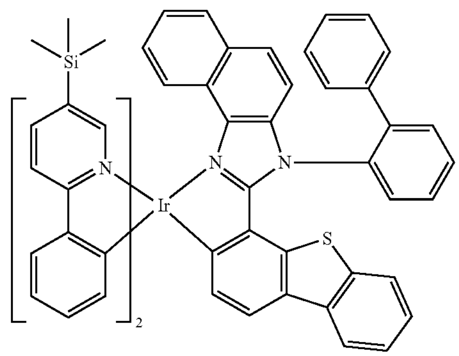
2521
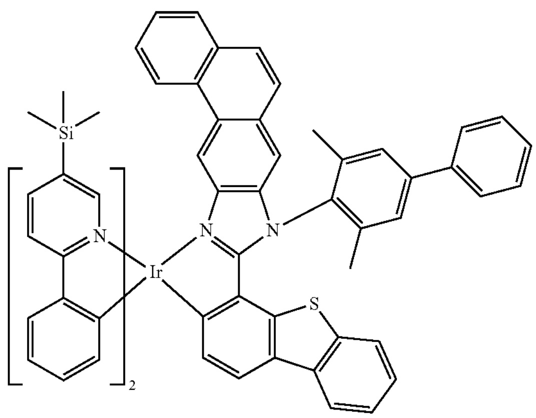
2522
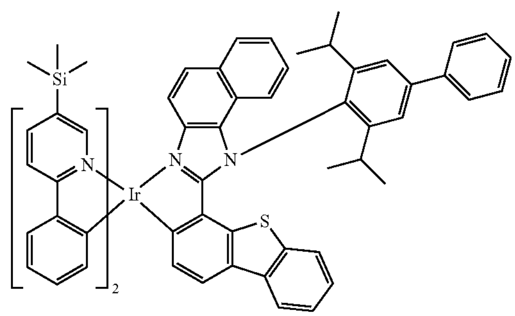

-continued
2523
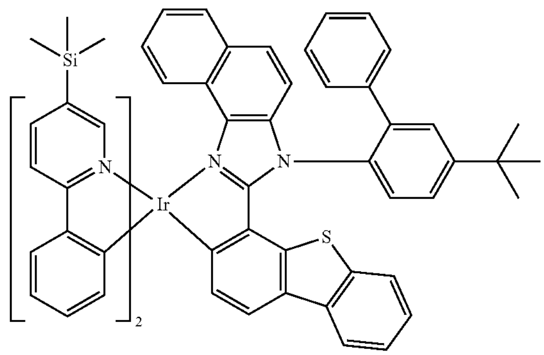
2524
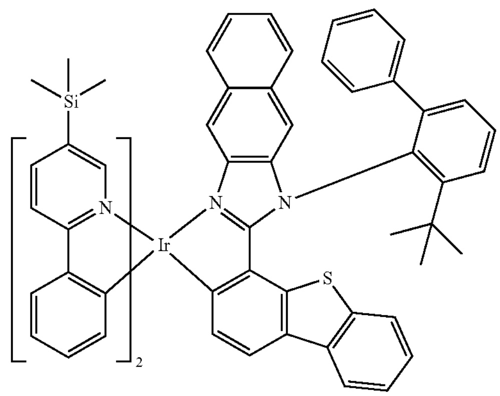
2525
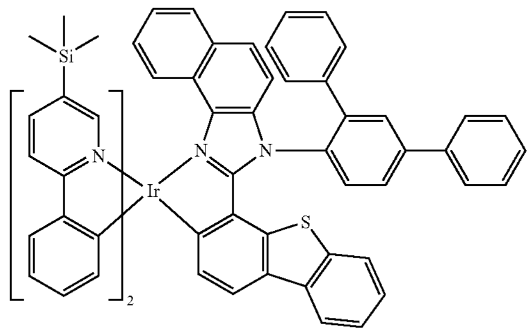
2526
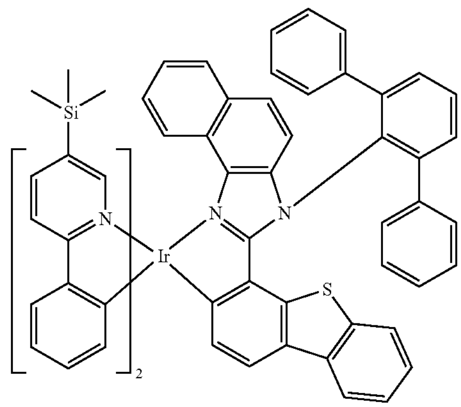
2527
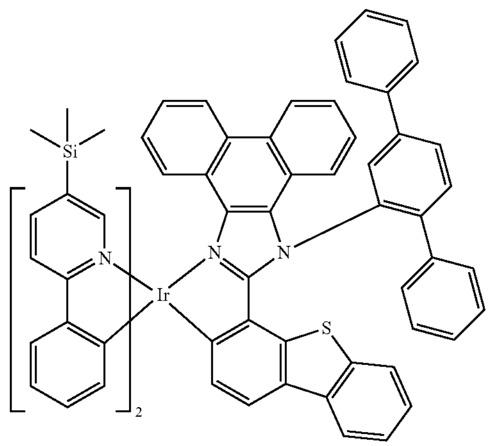
2528
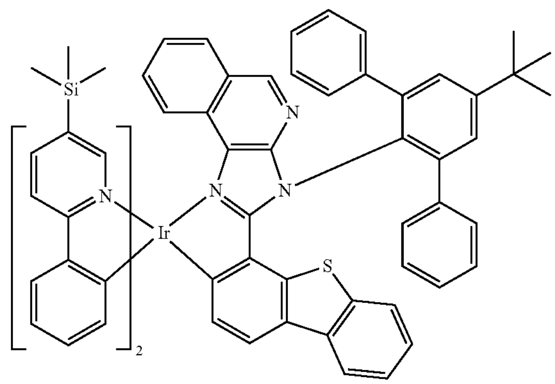

-continued
2529
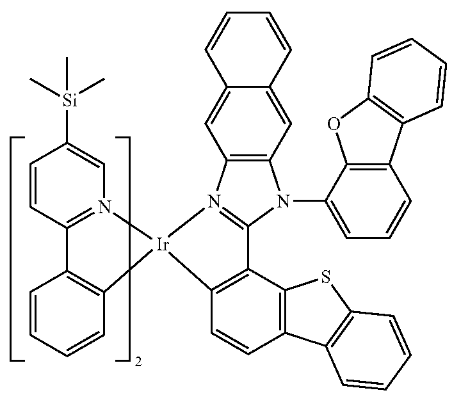
2530
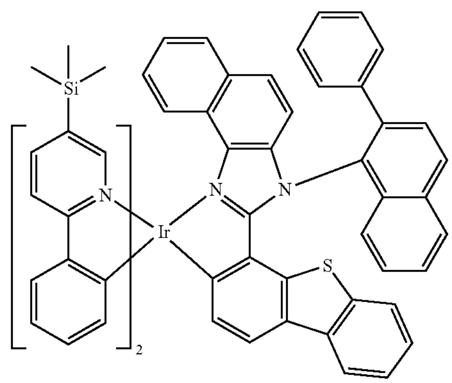
2531
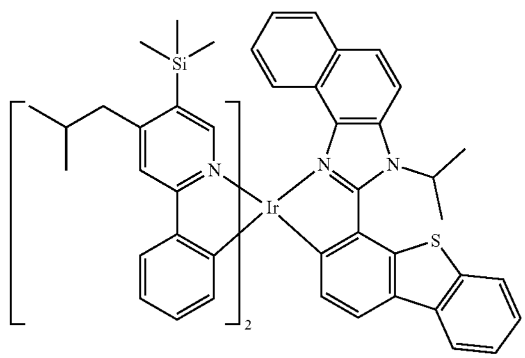
2532
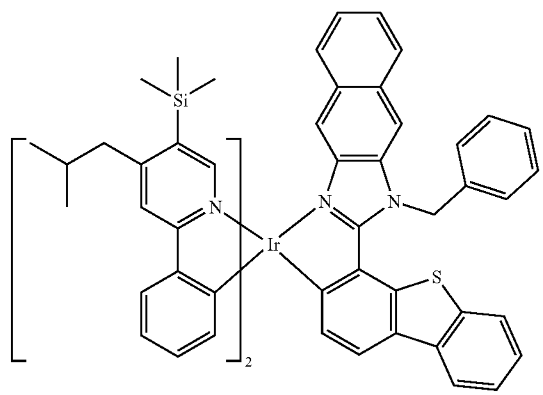
2533
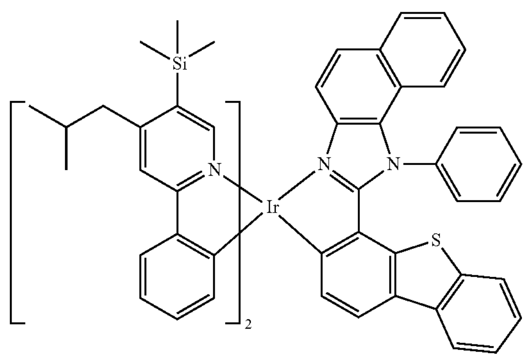
2534
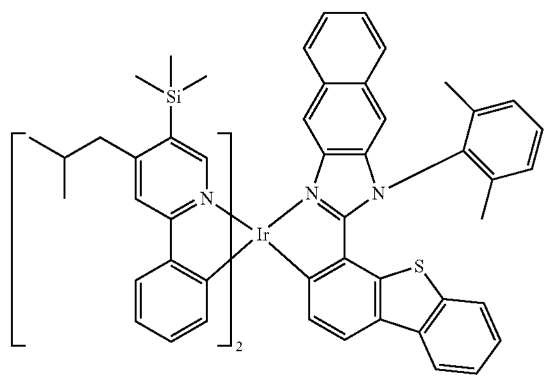
2535
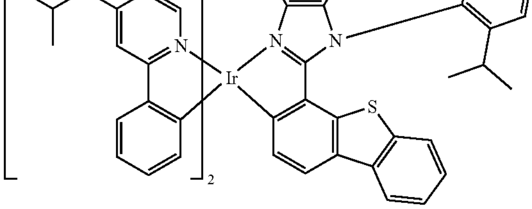
2536
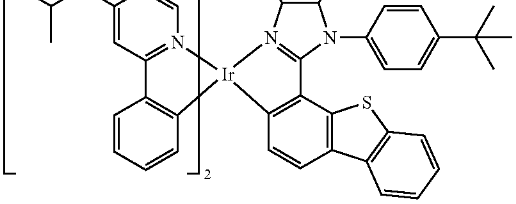

-continued
2537
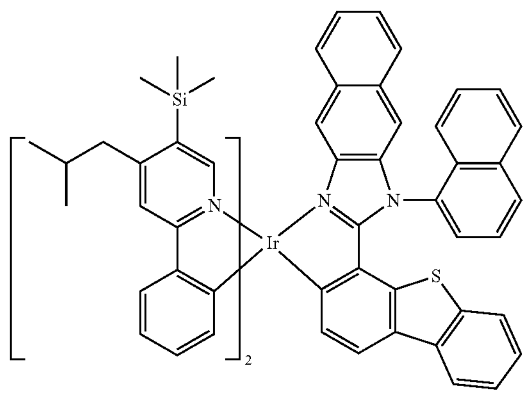
2538
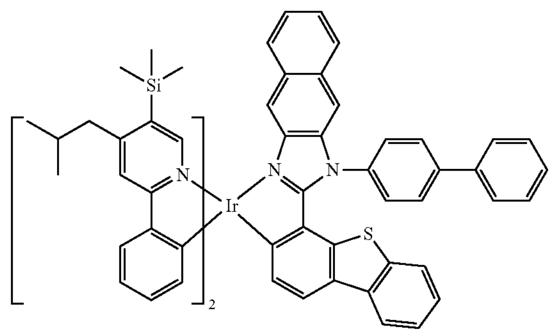
2539
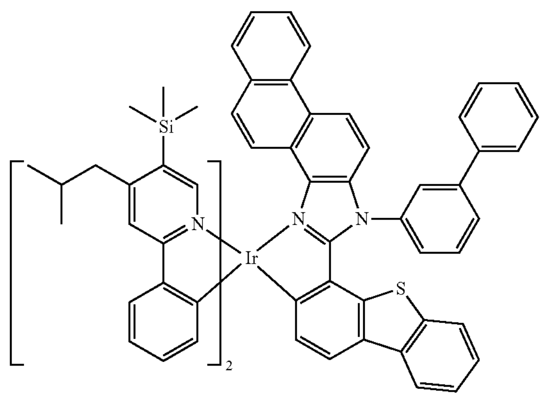
2540
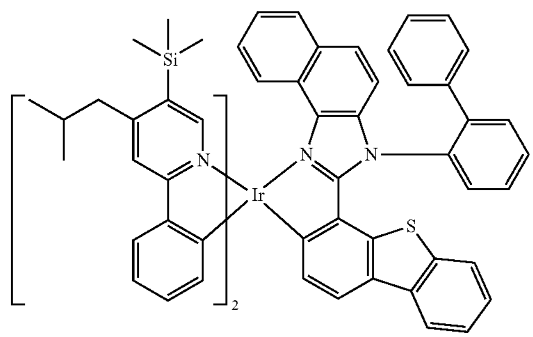
2541
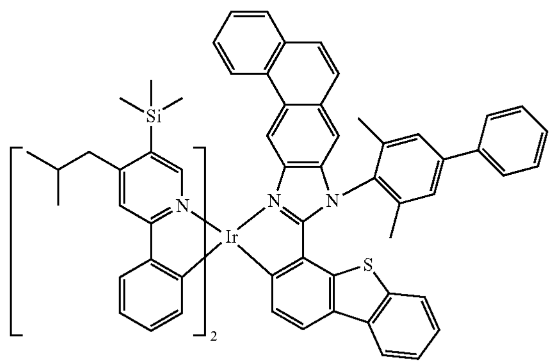
2542
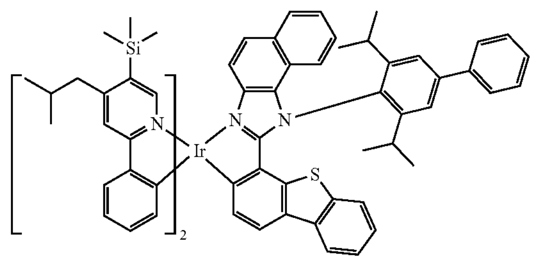
2543
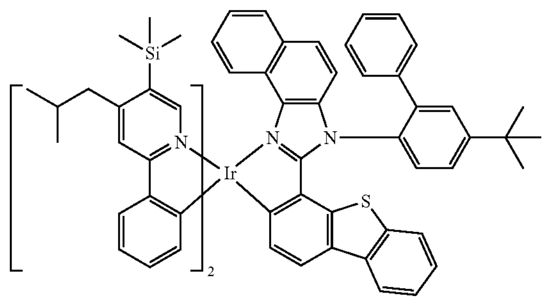
2544
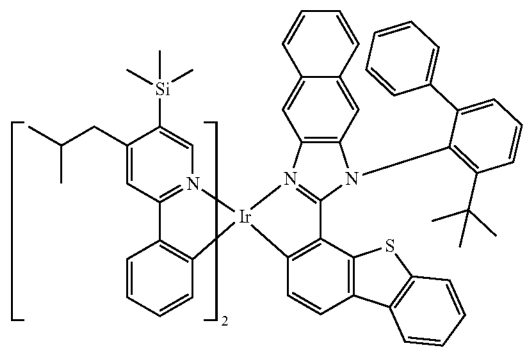

-continued
2545
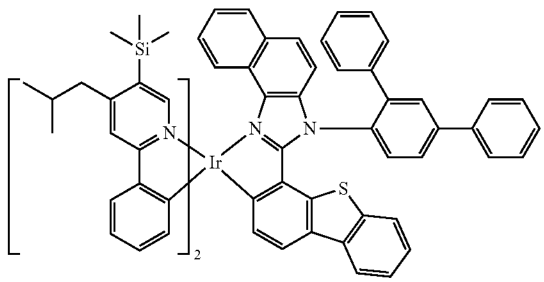
2546
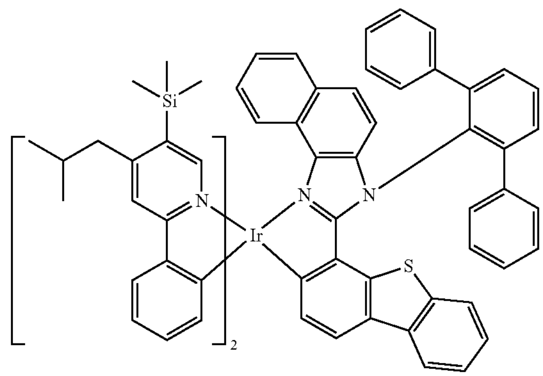
2547
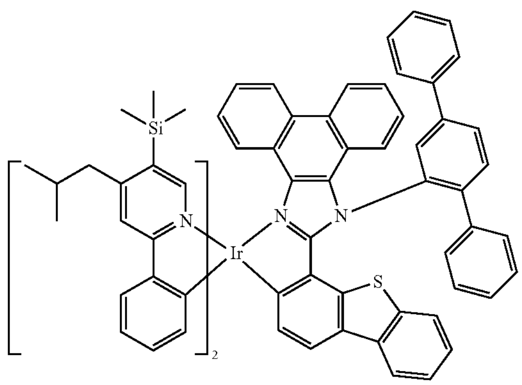
2548
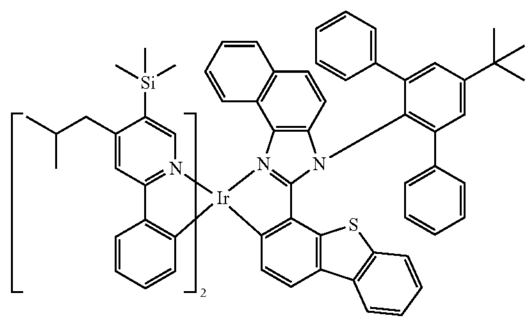
2549
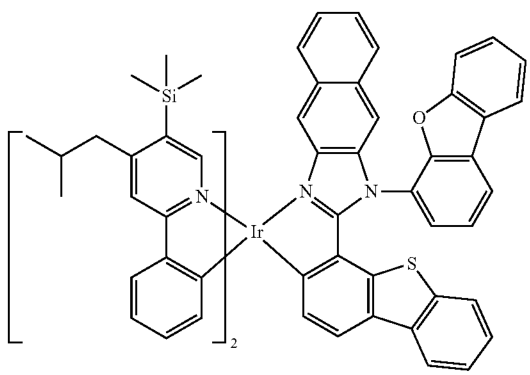
2550
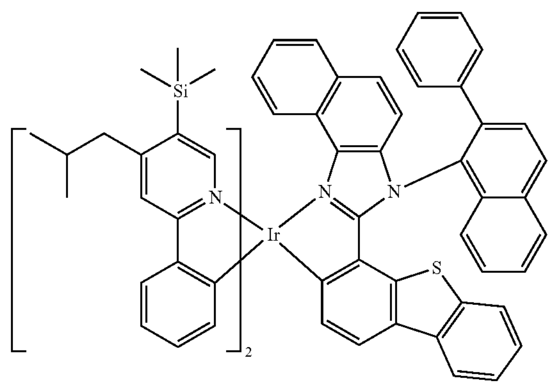
2551
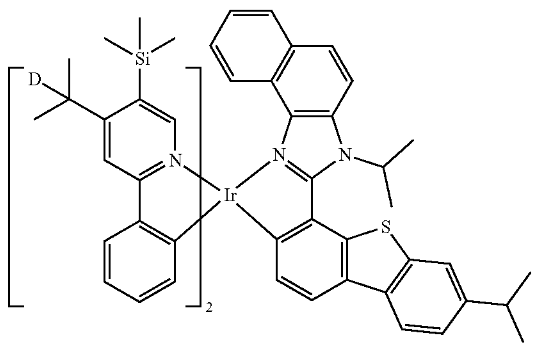
2552
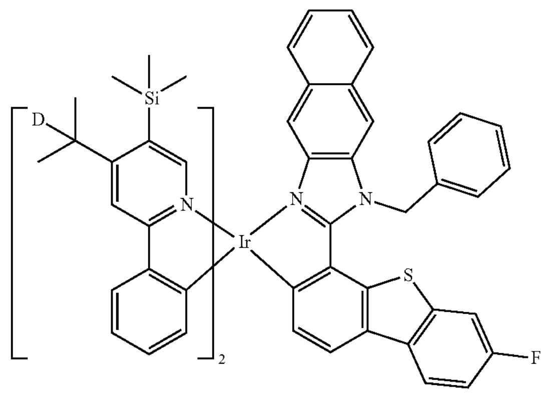

-continued
2553
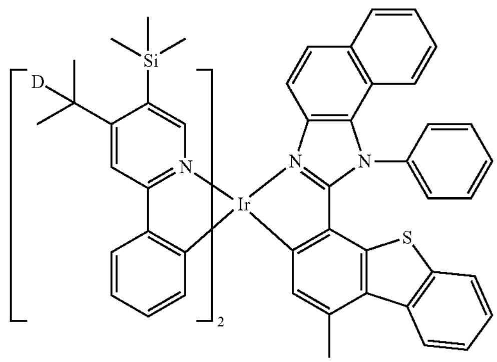
2554
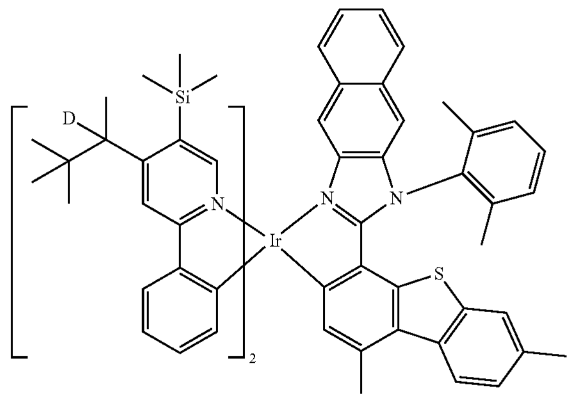
2555
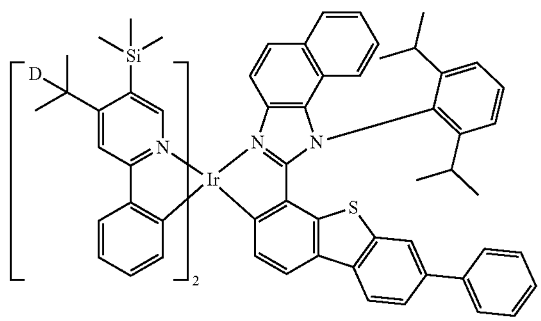
2556
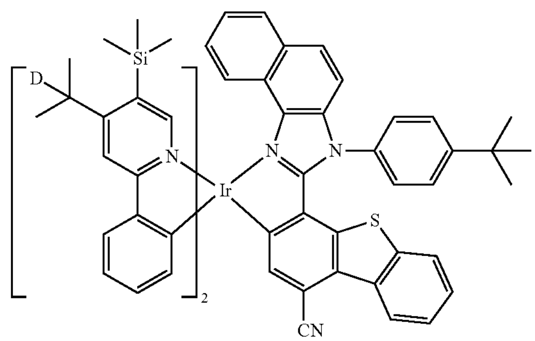
2557
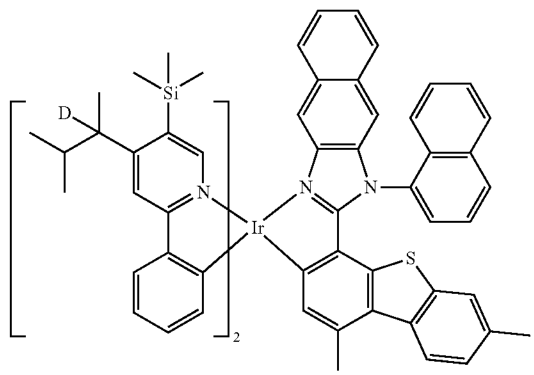
2558
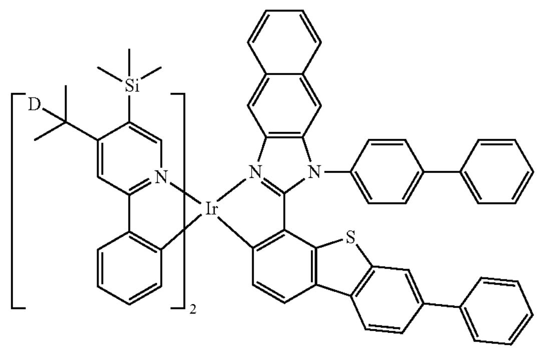

-continued
2559
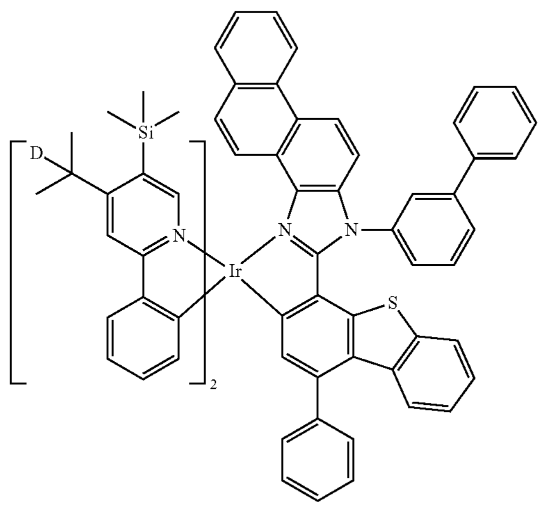
2560
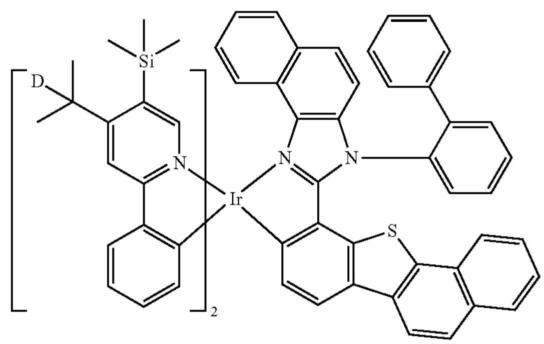
2561
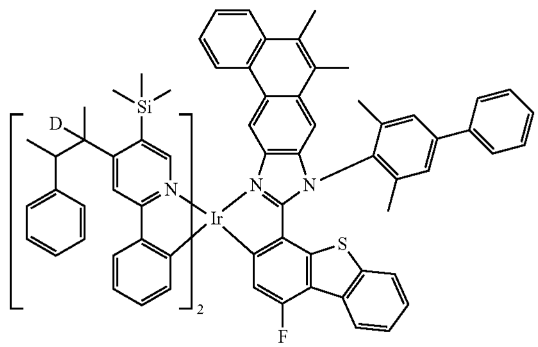
2562
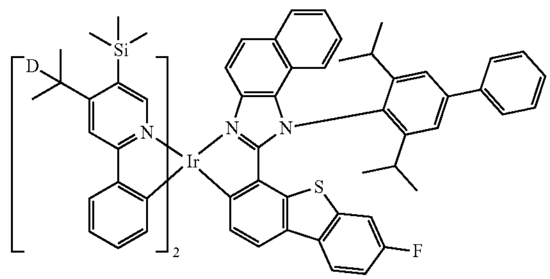
2563
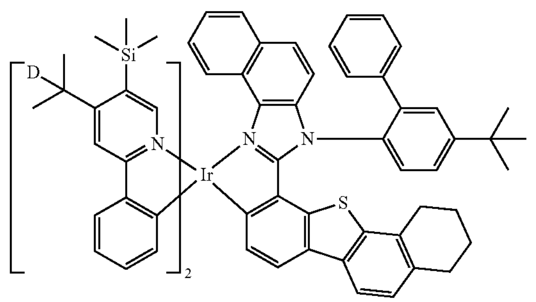
2564
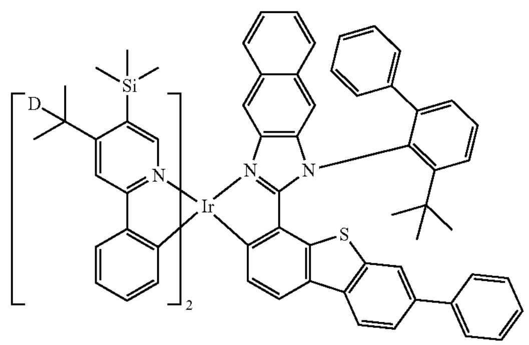
2565
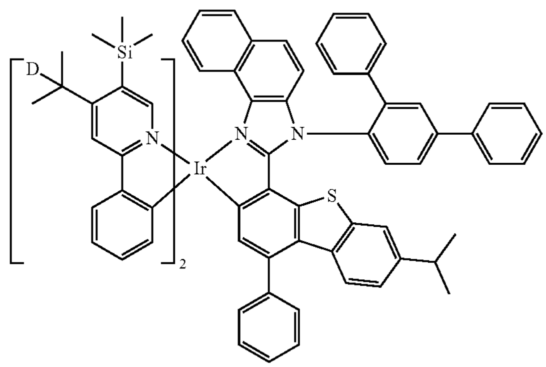
2566
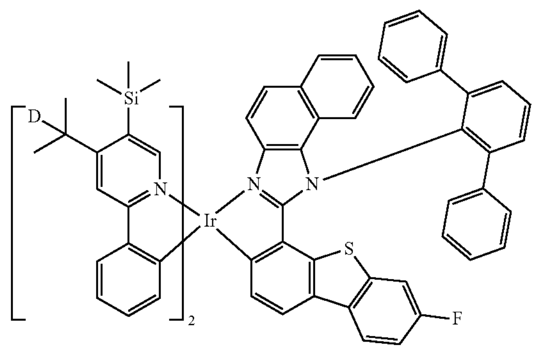

-continued
2567
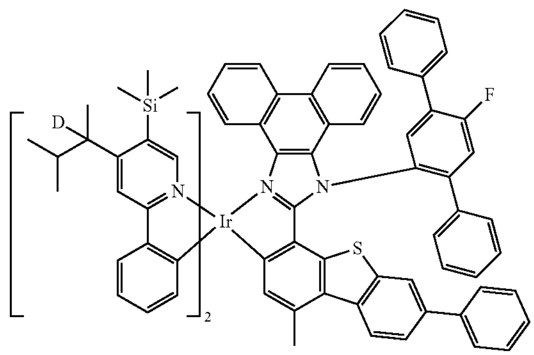
2568
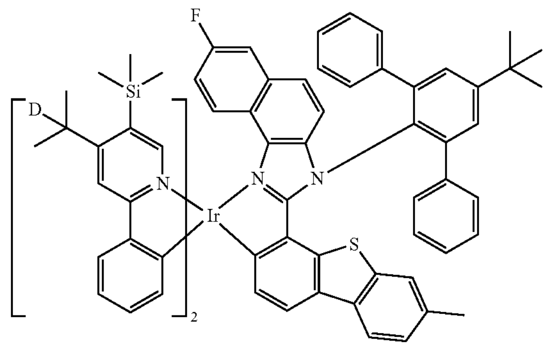
2569
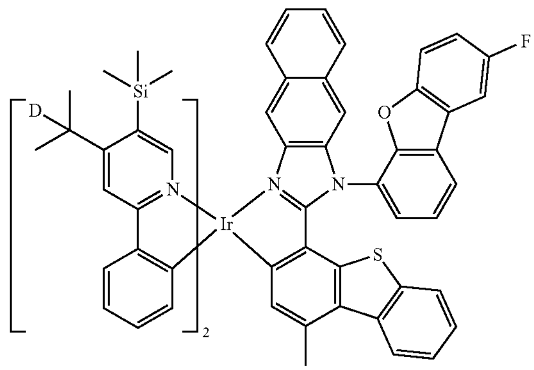
2570
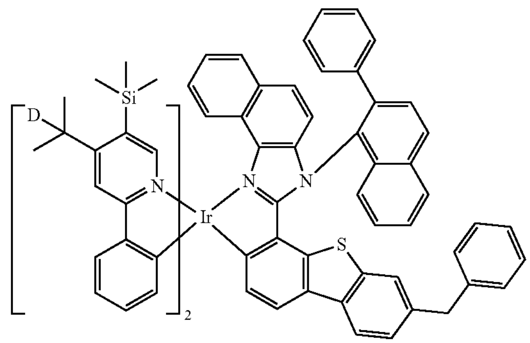
2571
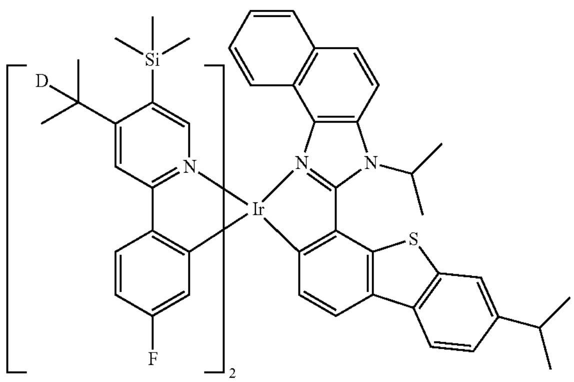
-continued
2572
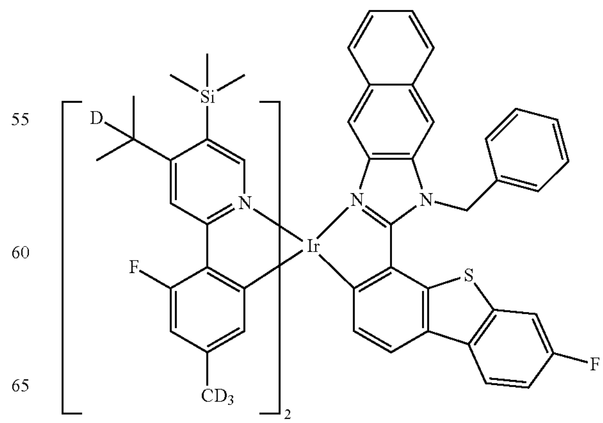

-continued
2573
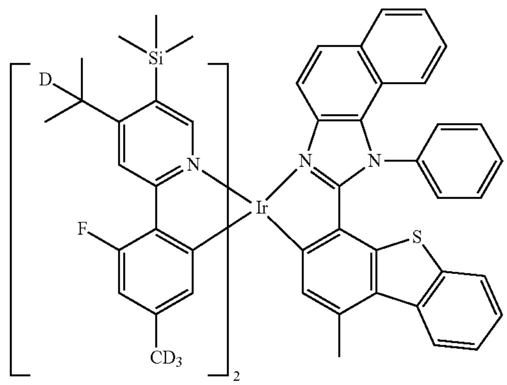
2574
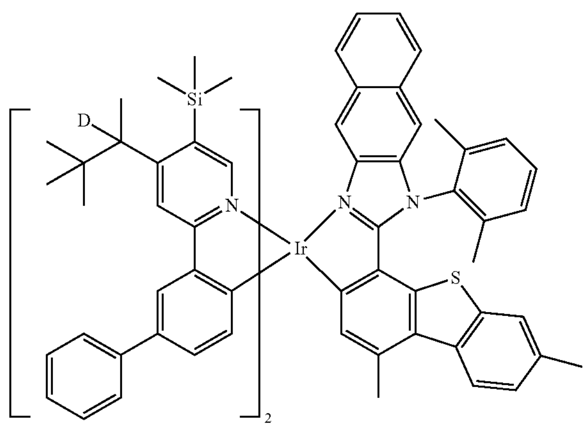
2575
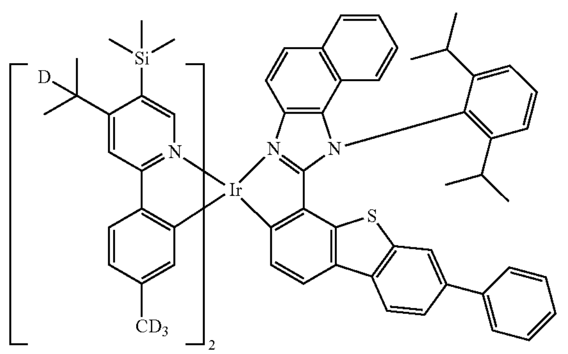
2576
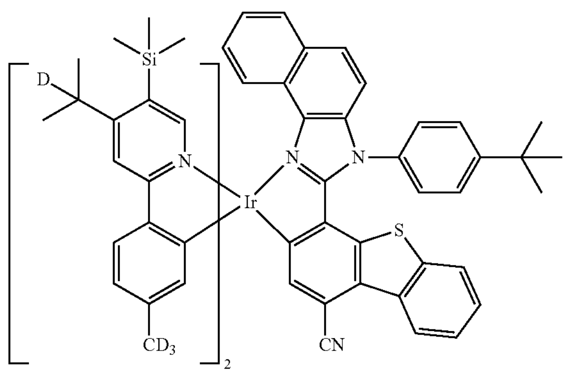
-continued
2577
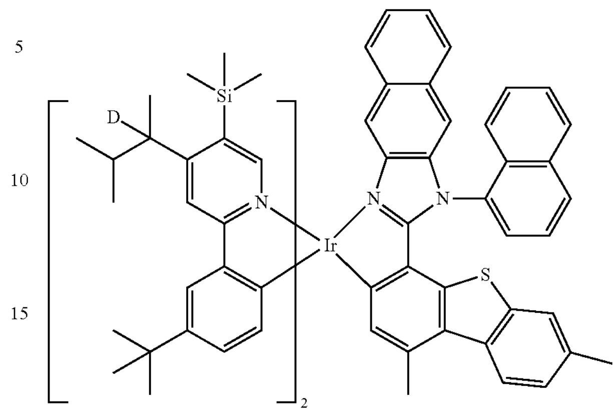
2578
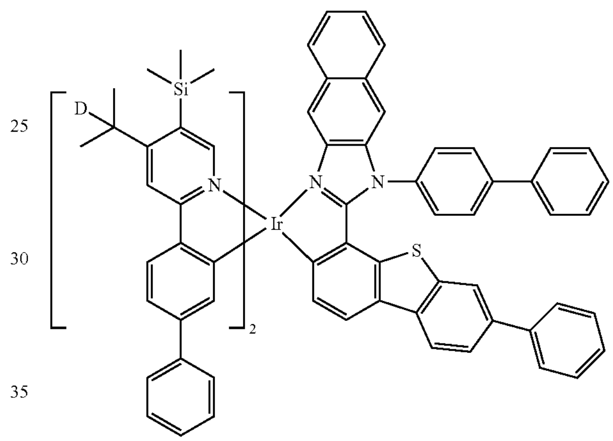
2579
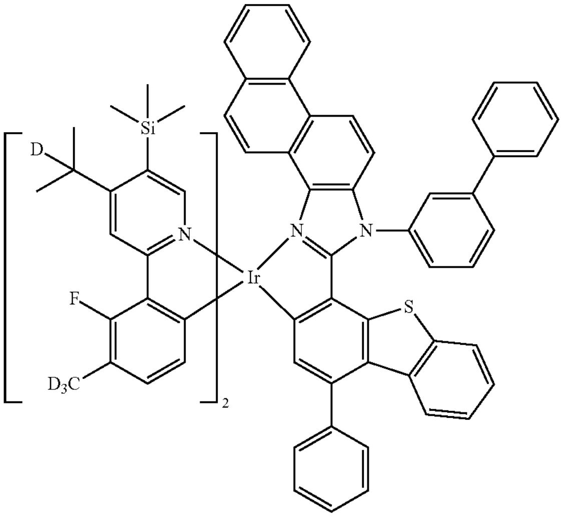

-continued
2580
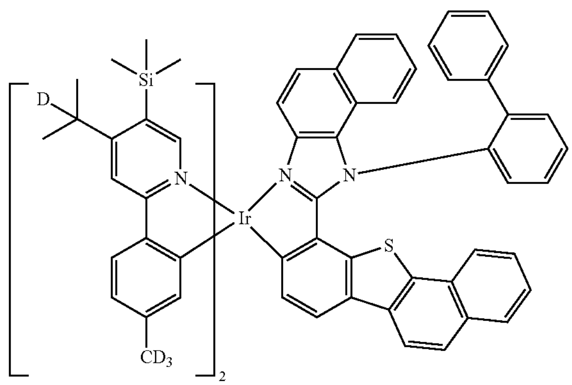
2581
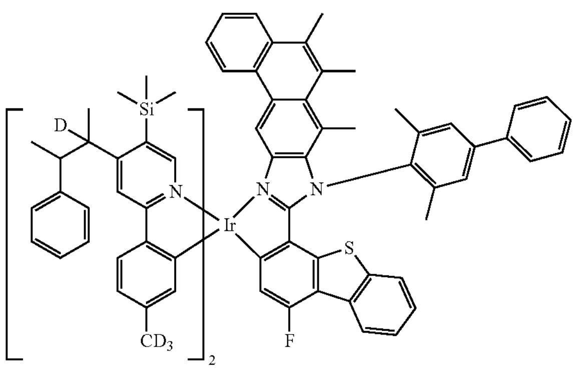
2582
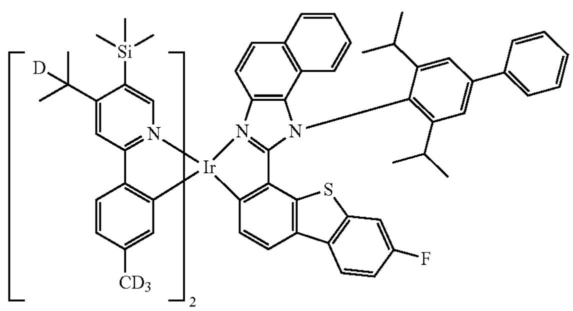
2583
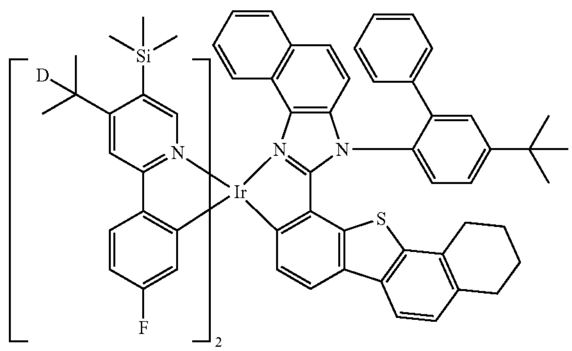
-continued
2584
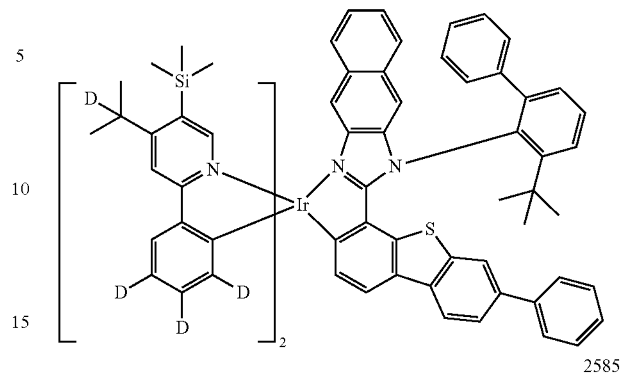
2585
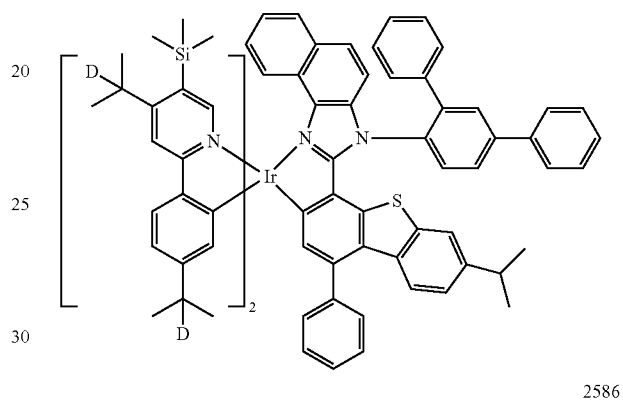
2586
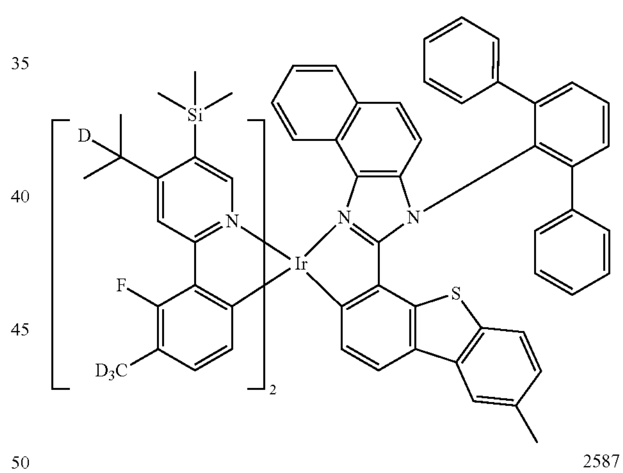
2587
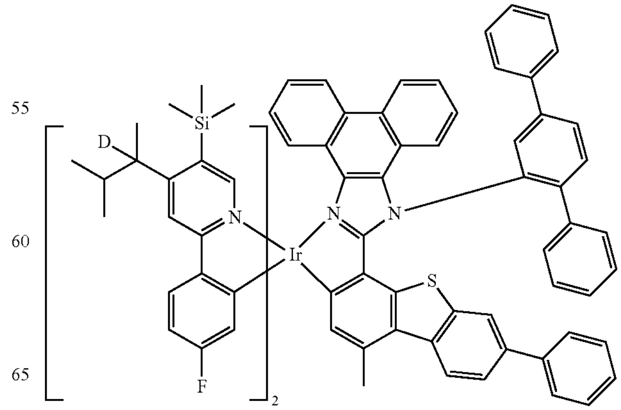

2588
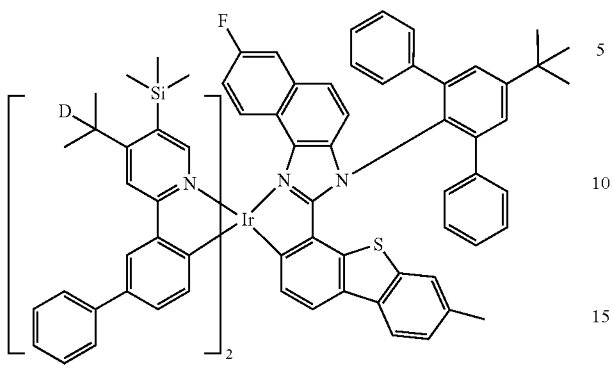
2589
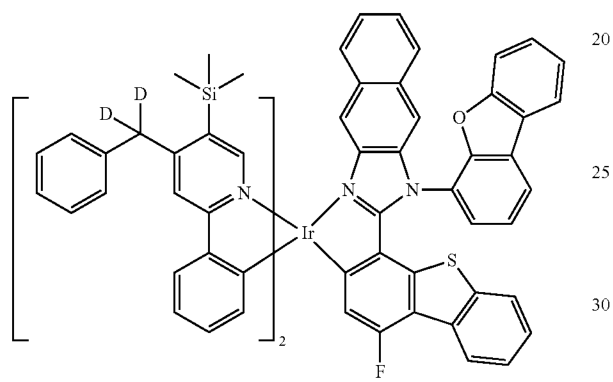
2590
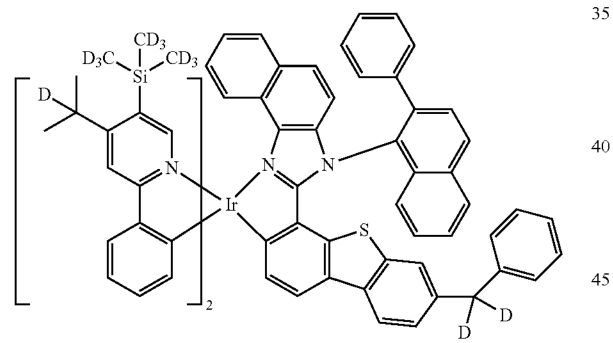
2591
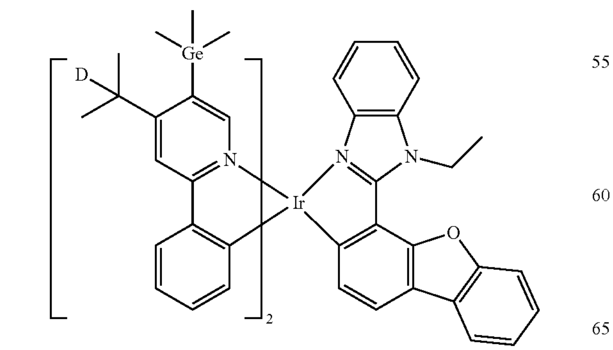
2592
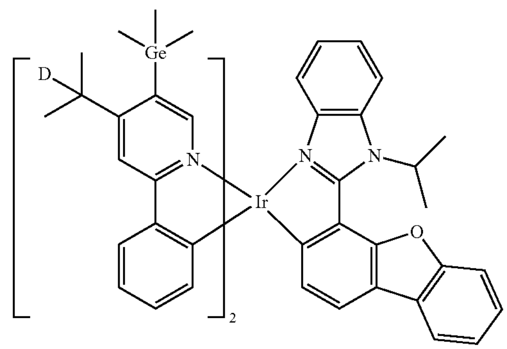
2593
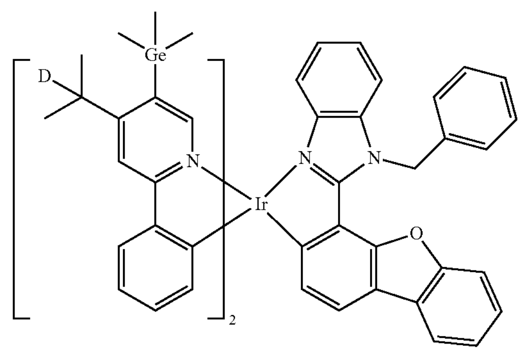
2594
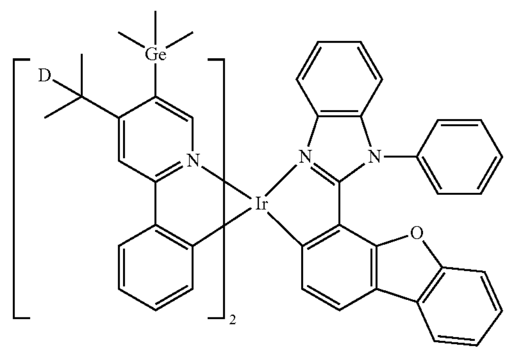
2595
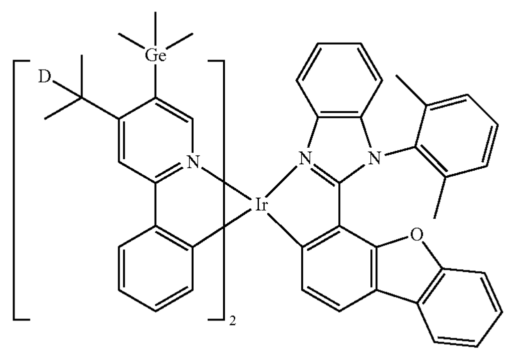

2596
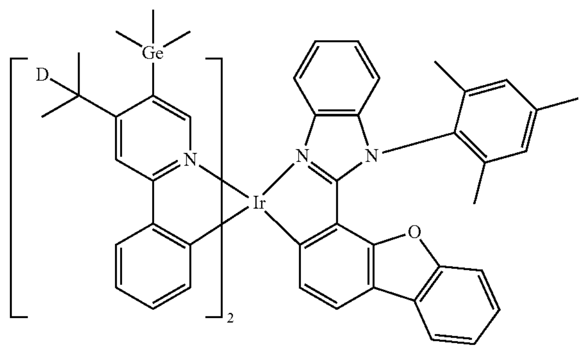
2597
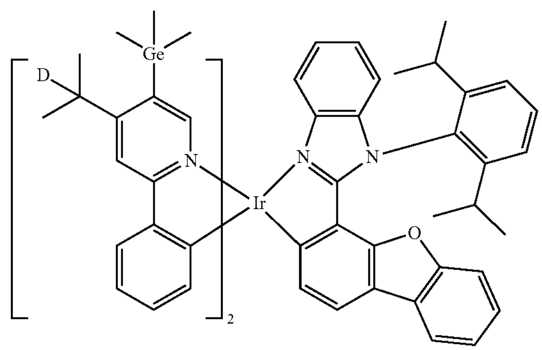
2598
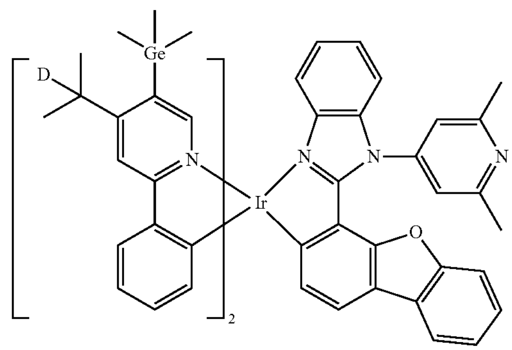
2599
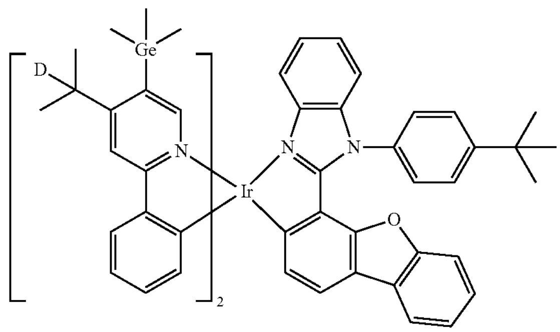
2600
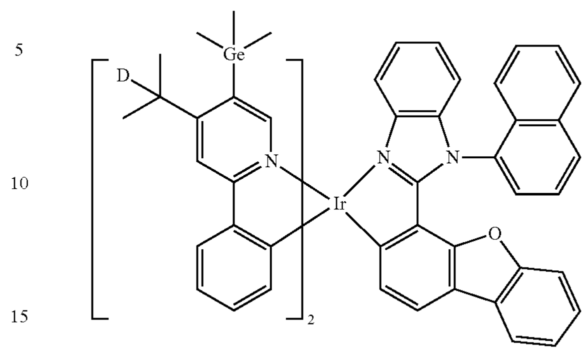
2601
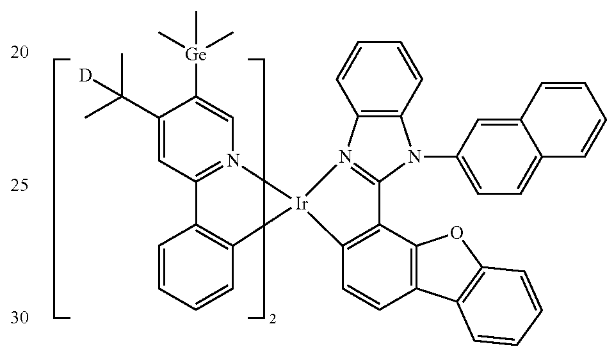
2602
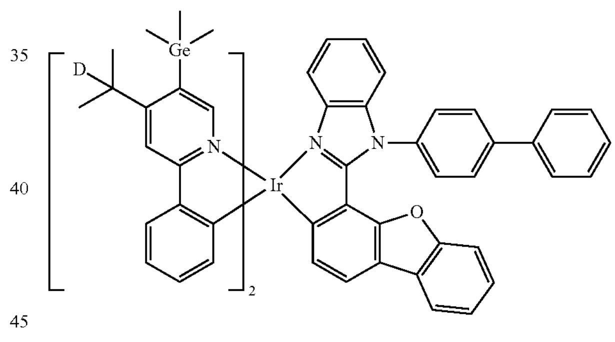
2603
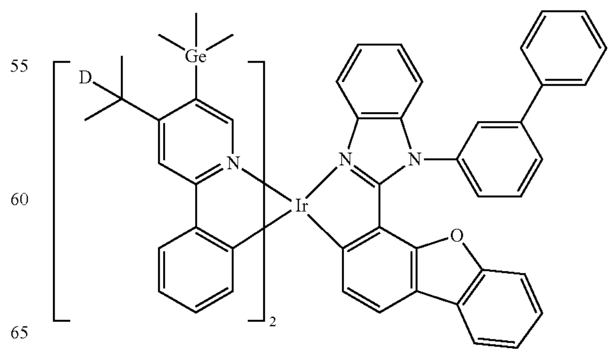

2604
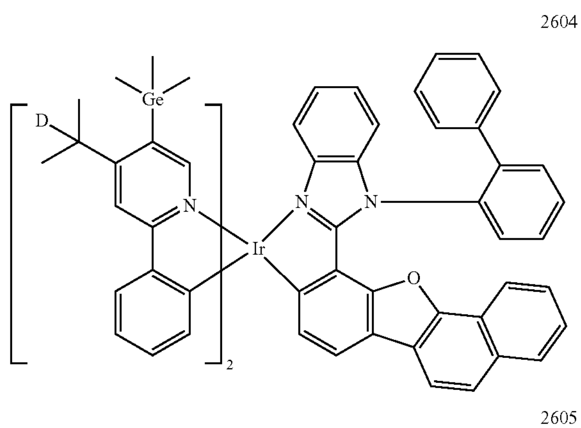
2605
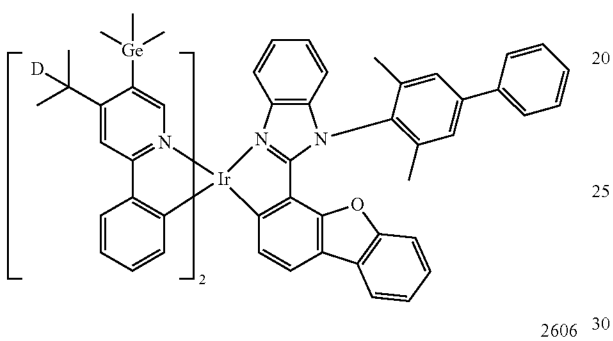
2606
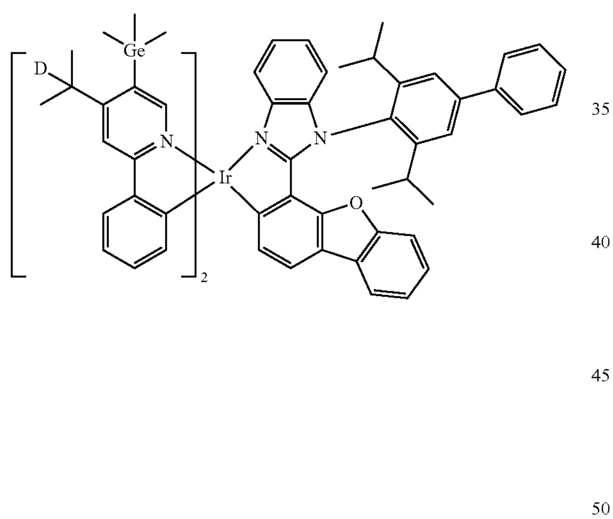
2607
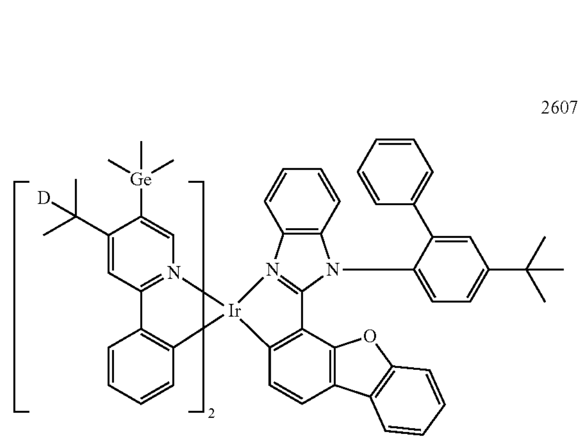
2608
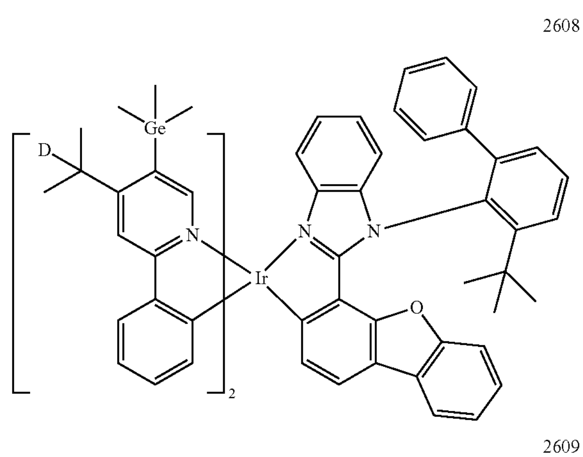
2609
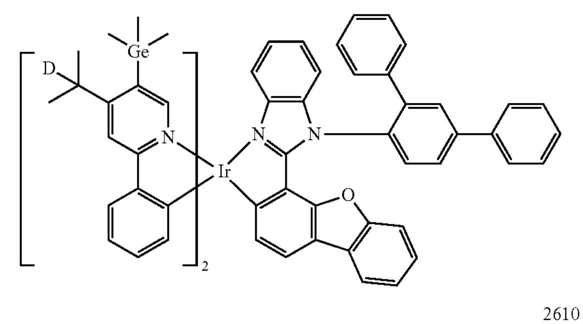
2610
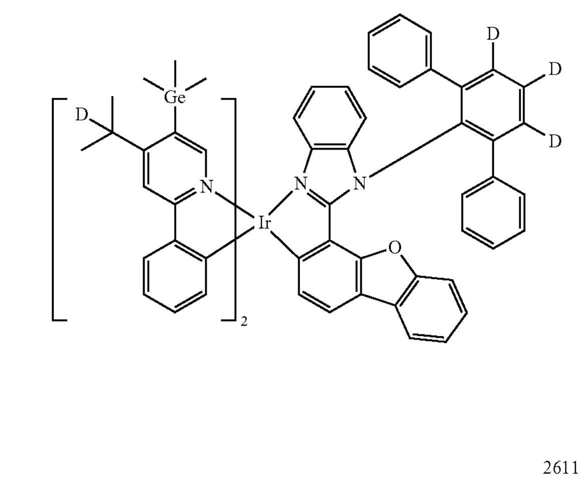
2611
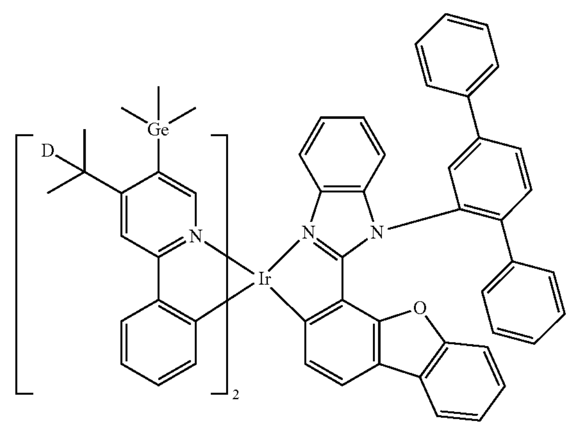

-continued
2612
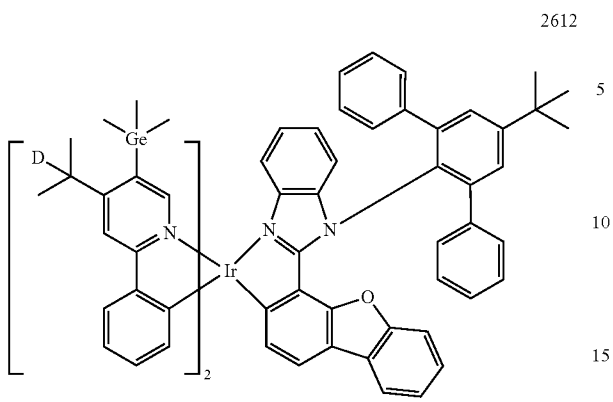
2613
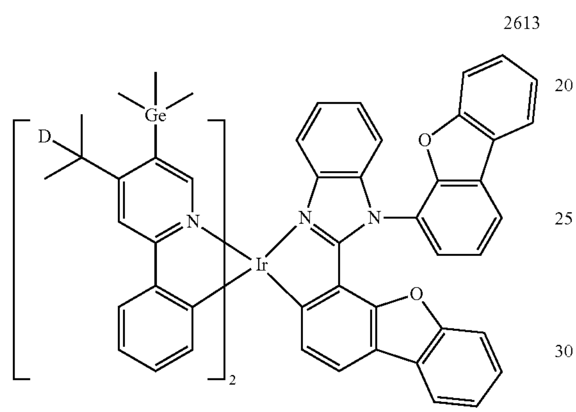
2614
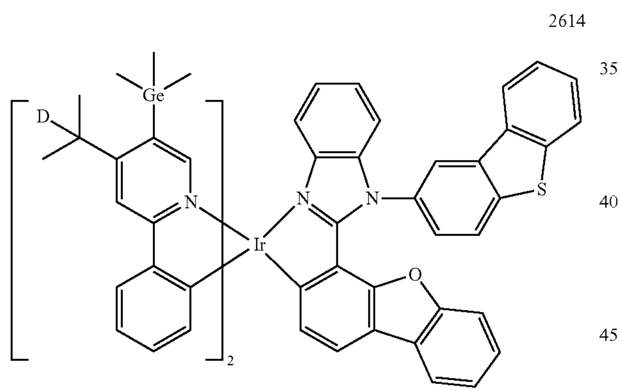
2615
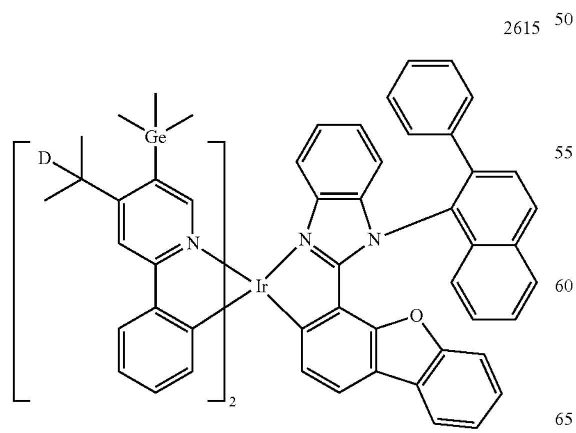
2616
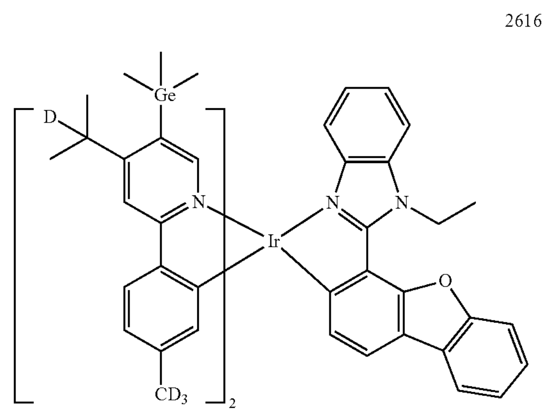
2617
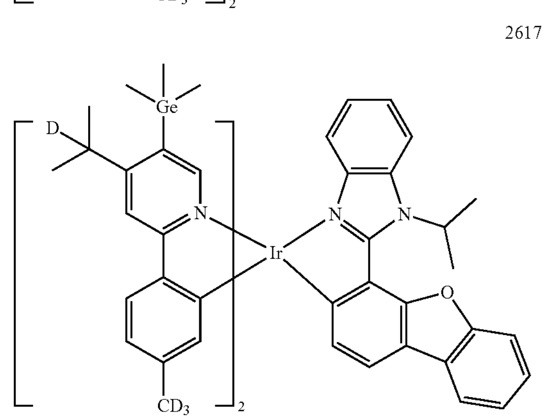
2618
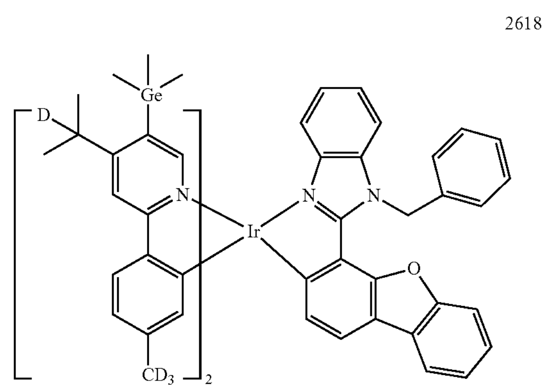
2619
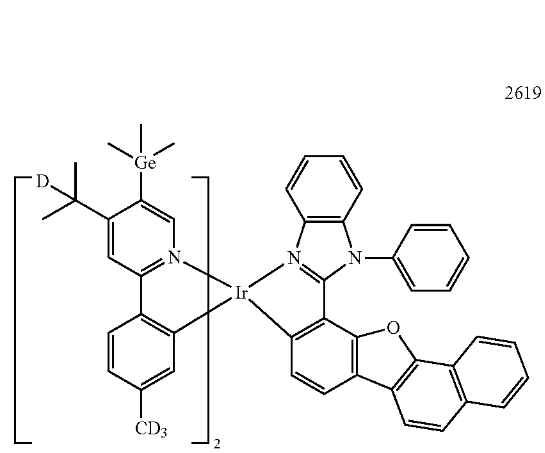

-continued
2620
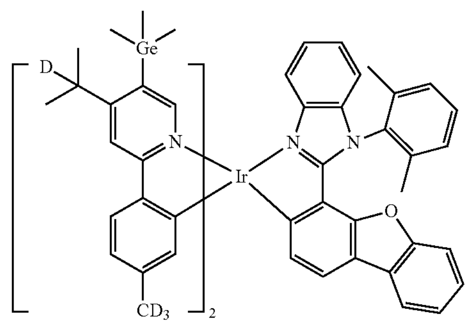
2621
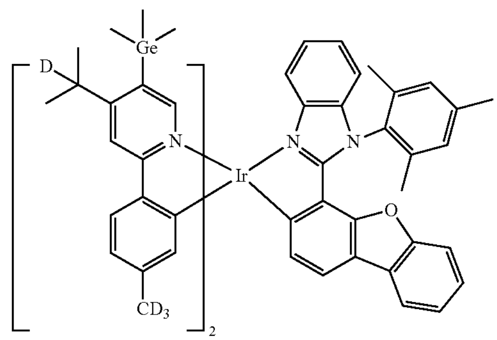
2622
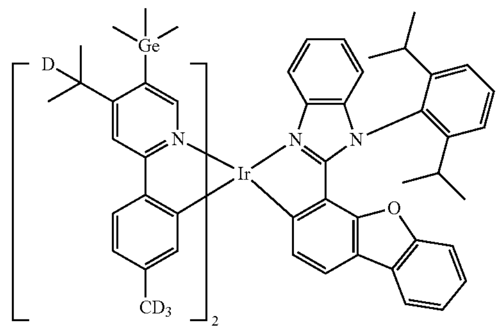
2623
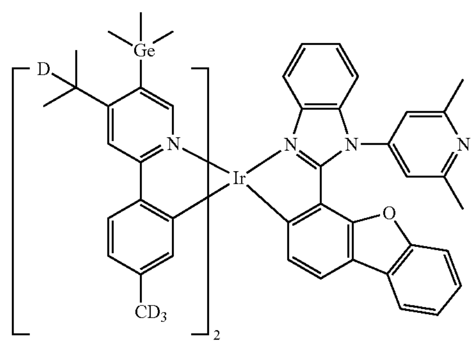
-continued
2624
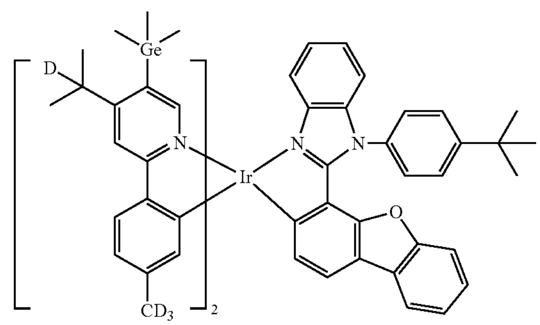
2625
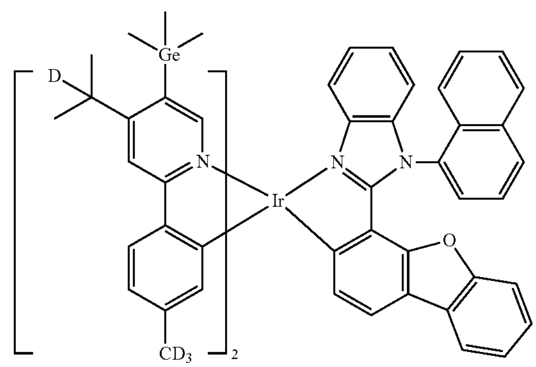
2626
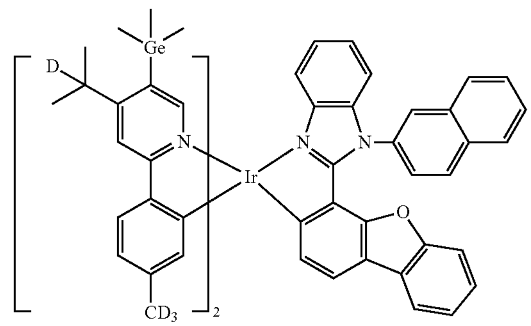
2627
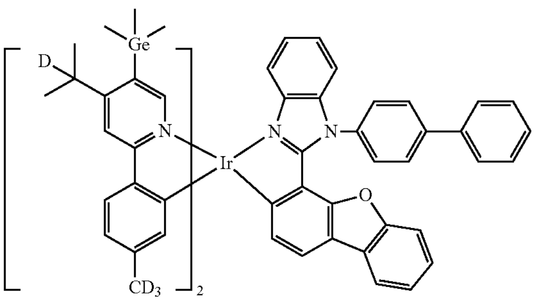

-continued
2628
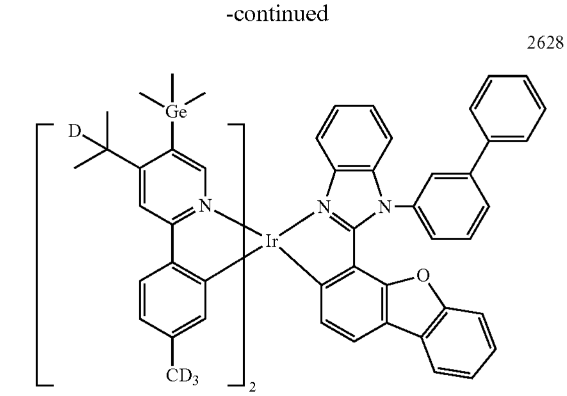
2629
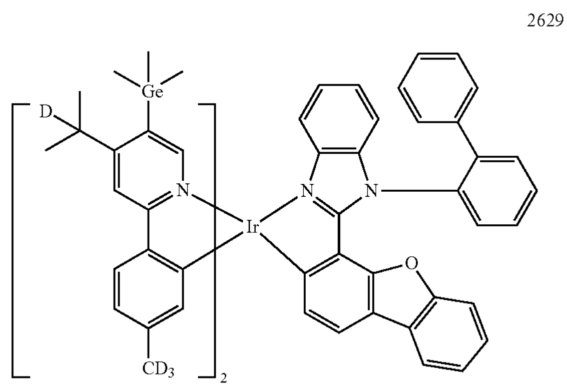
2630
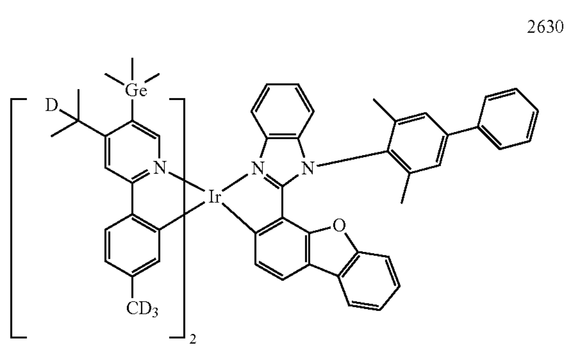
2631
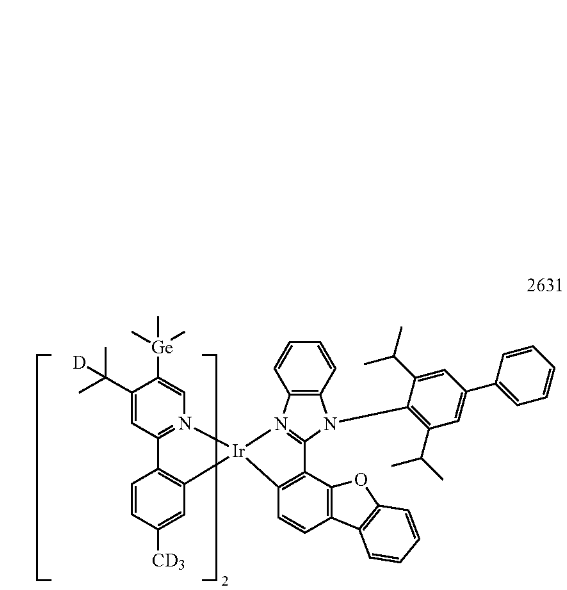
-continued
2632
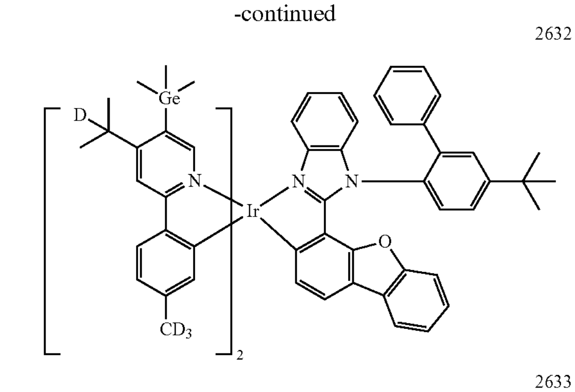
2633
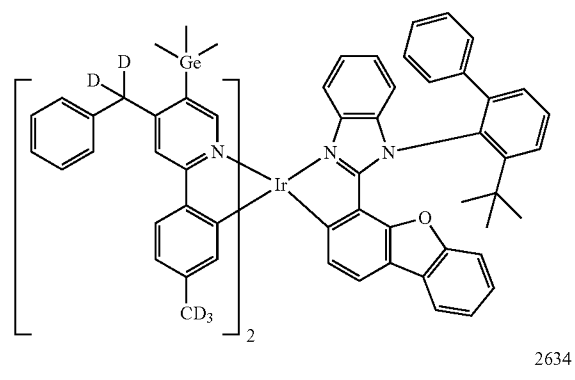
2634
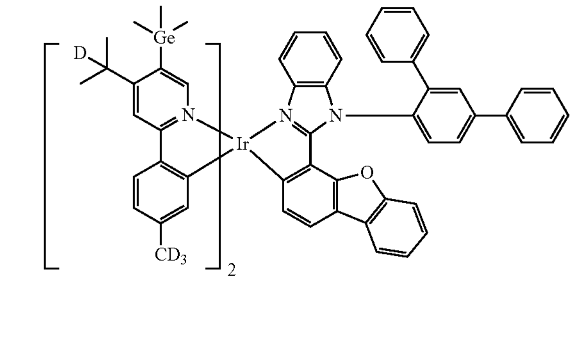
2635
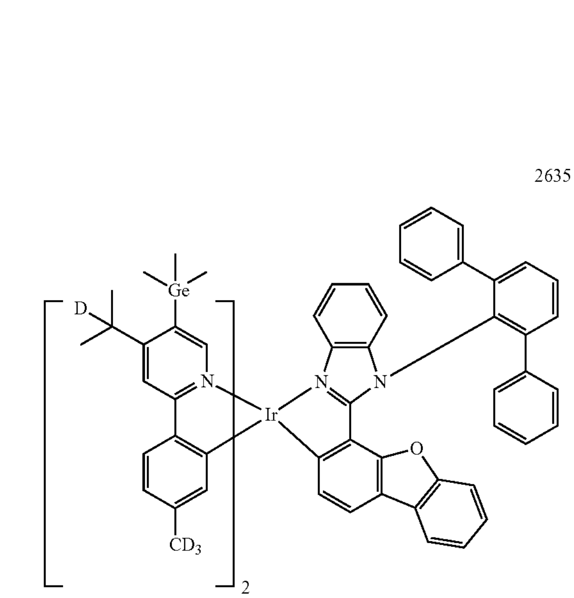

-continued
2636
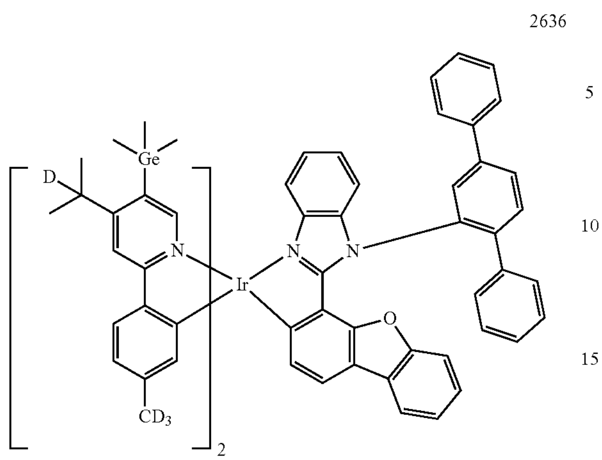
2637
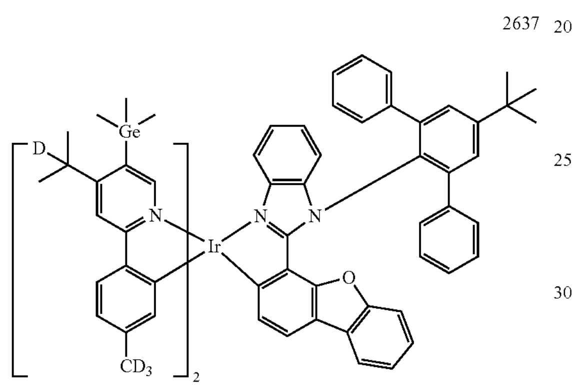
2638
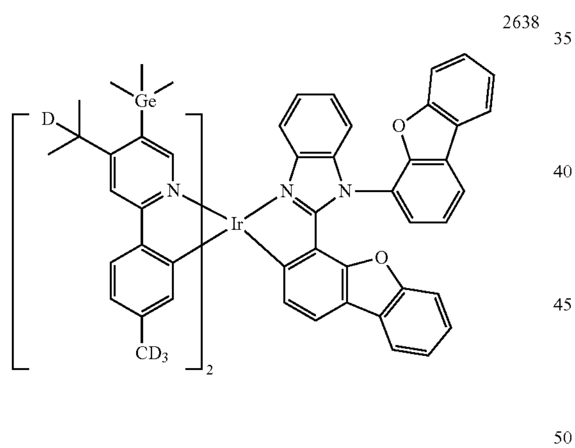
2639
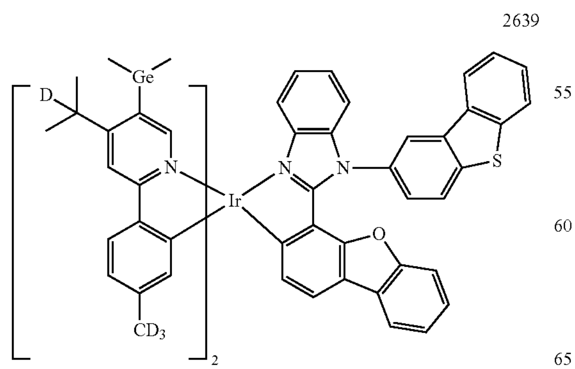
-continued
2640
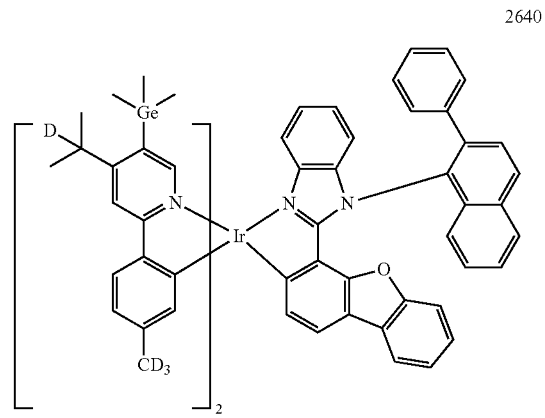
2641
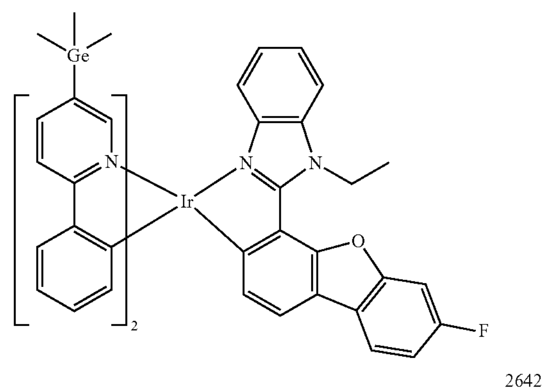
2642
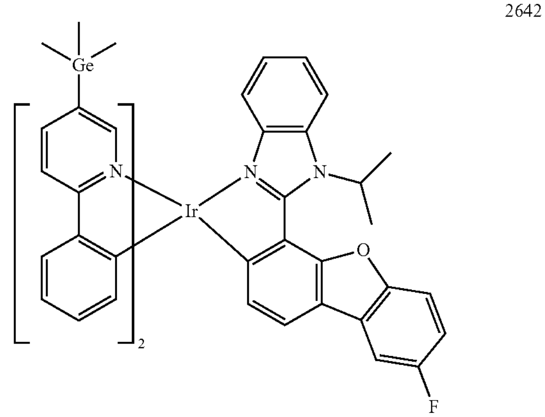
2643
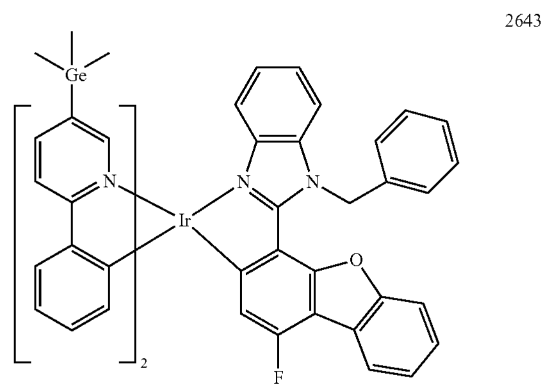

-continued
2644
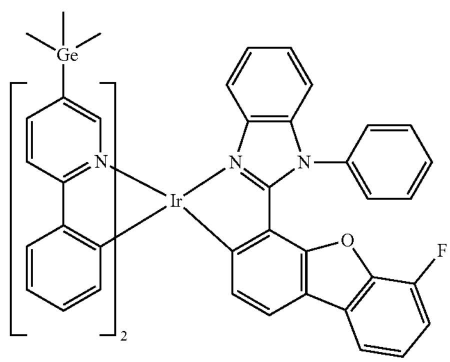
2645
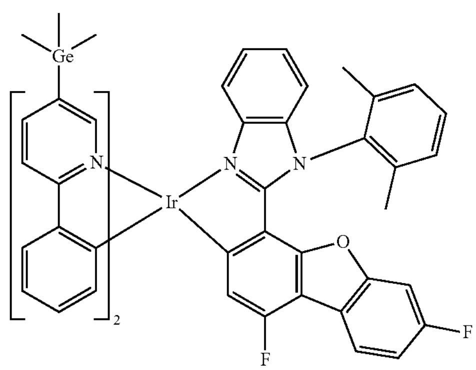
2646
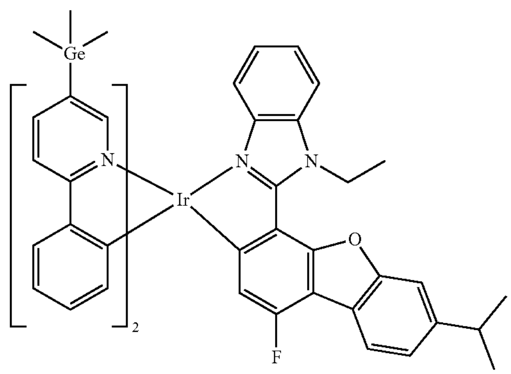
2647
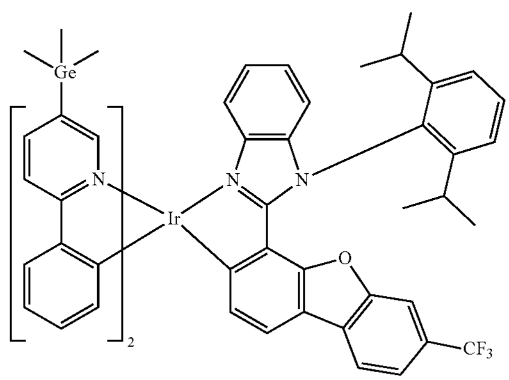
-continued
2648
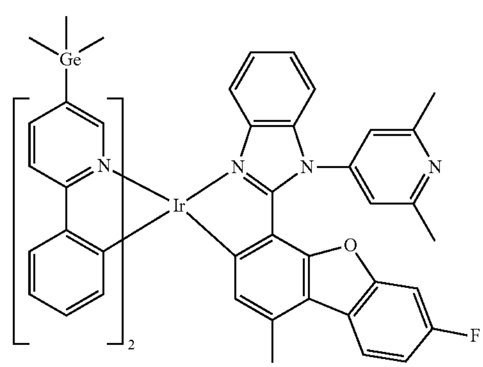
2649
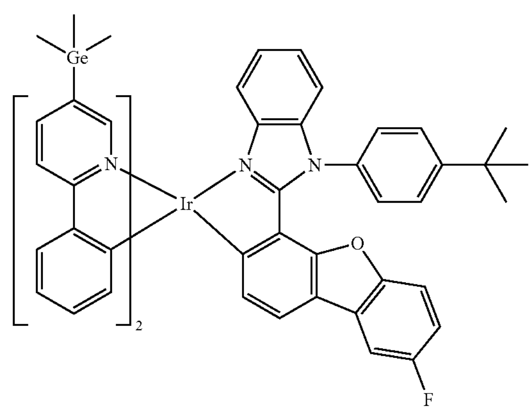
2650
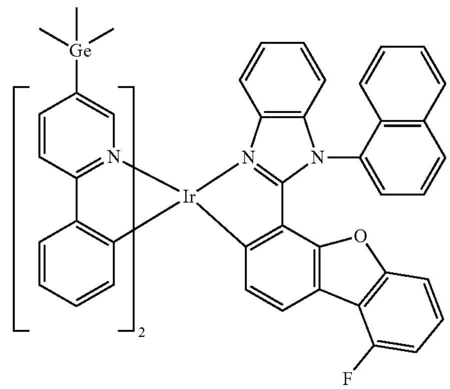
2651
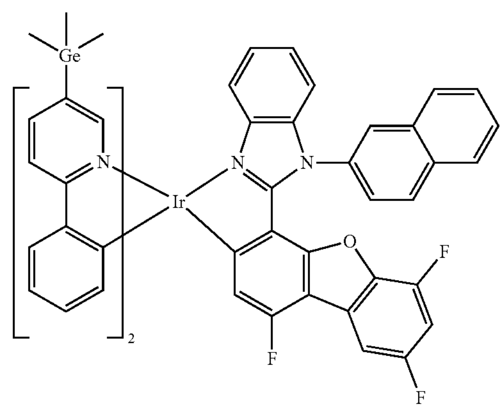

-continued
2652
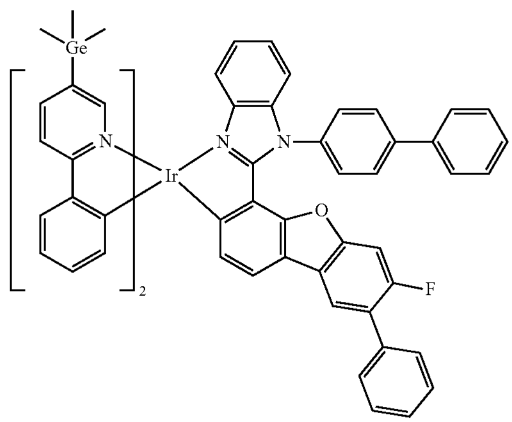
2653
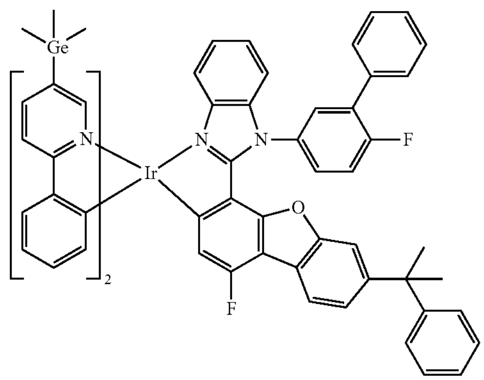
2654
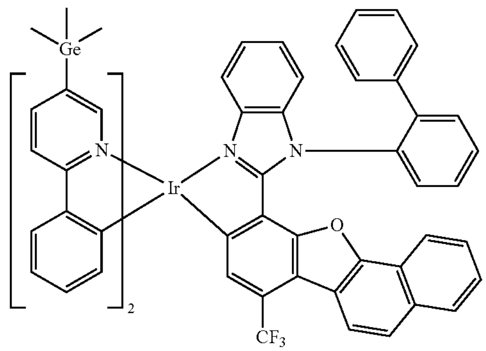
2655
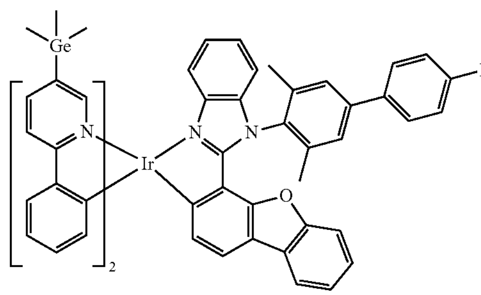
-continued
2656
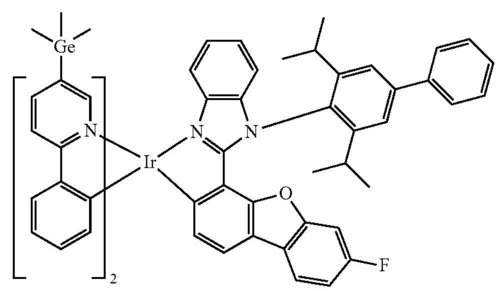
2657
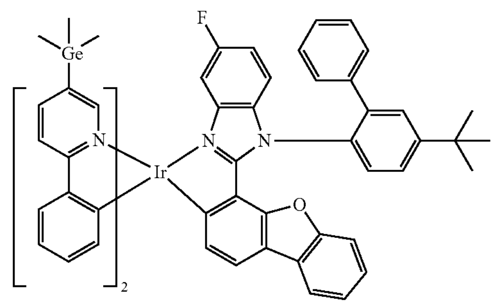
2658
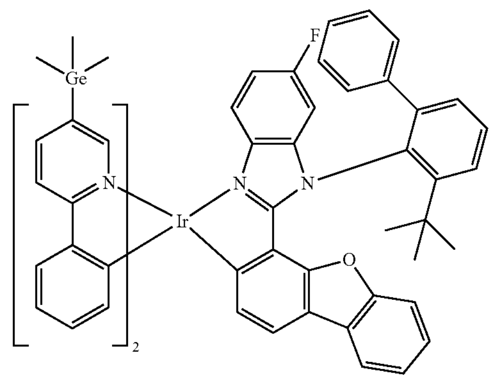
2659
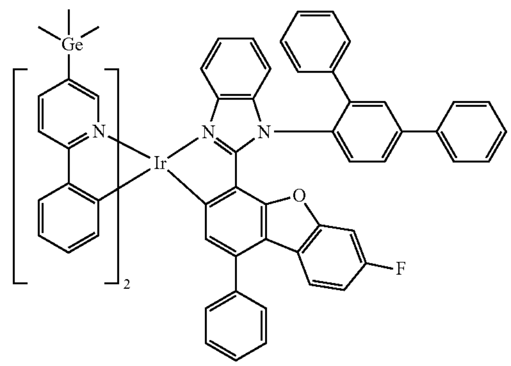

-continued
2660
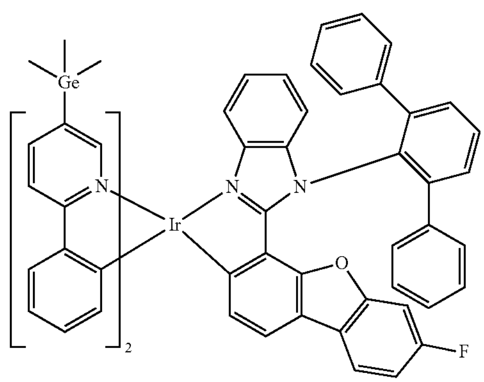
2661
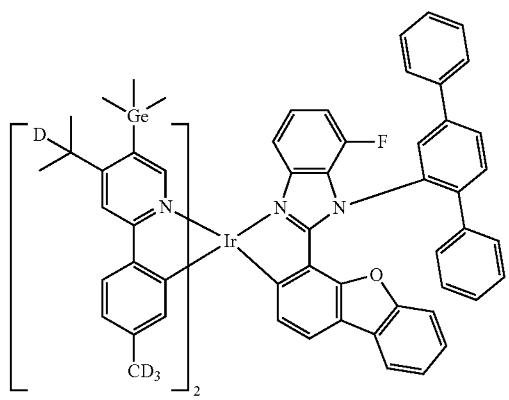
2662
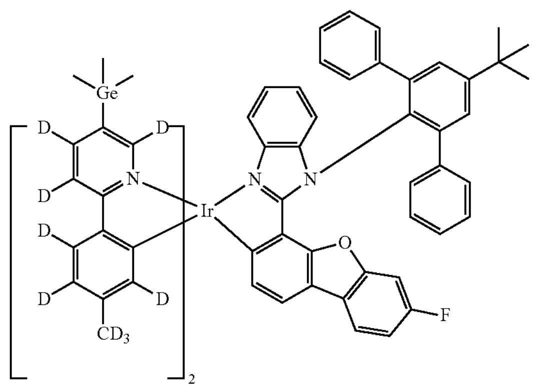
2663
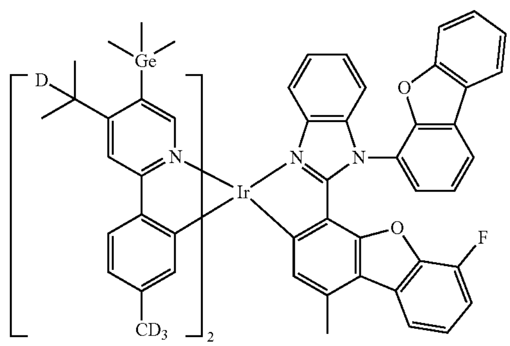
-continued
2664
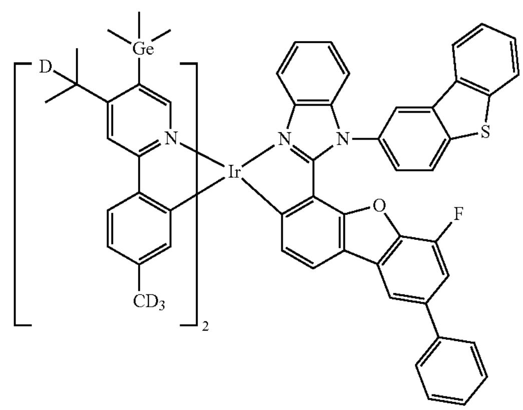
2665
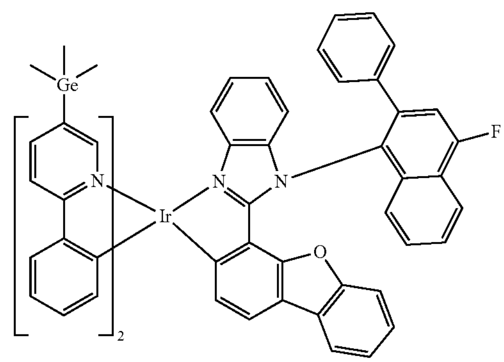
2666
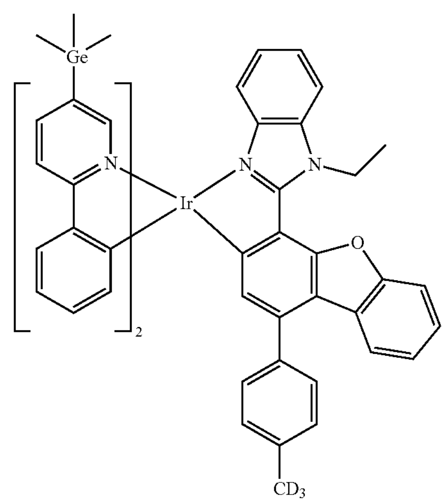

-continued
2667
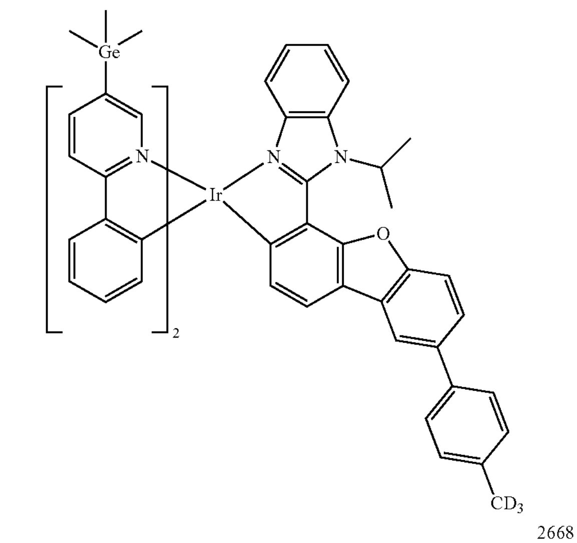
2668
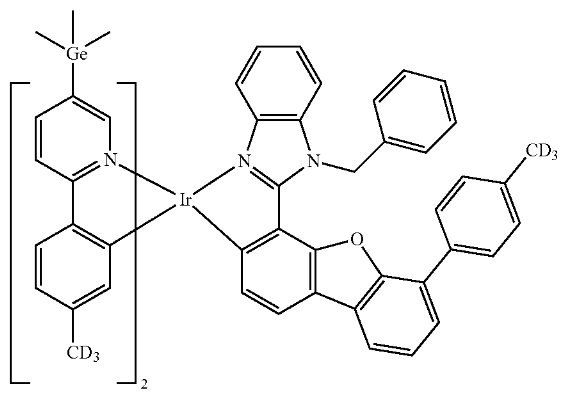
2669
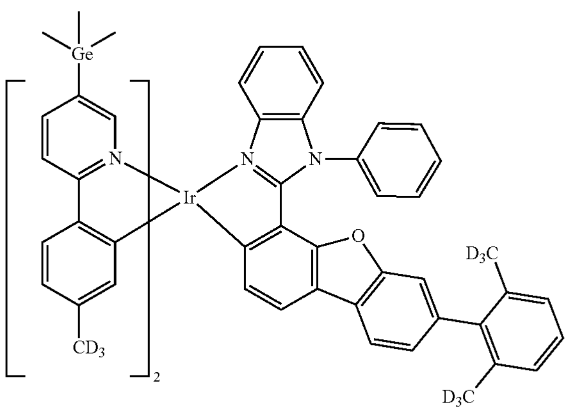
-continued
2670
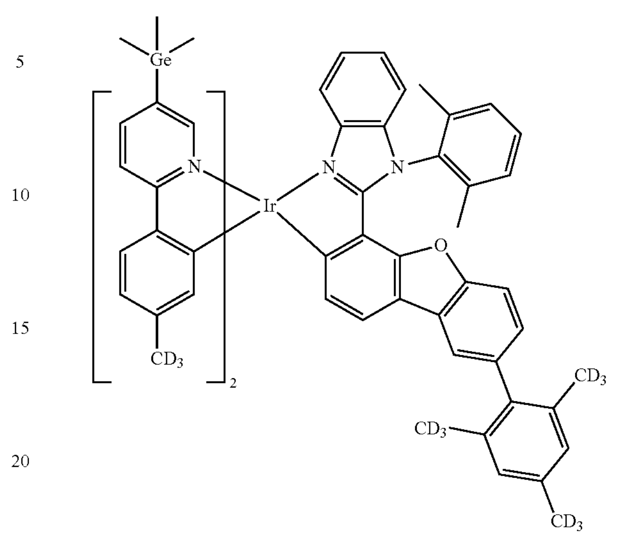
2671
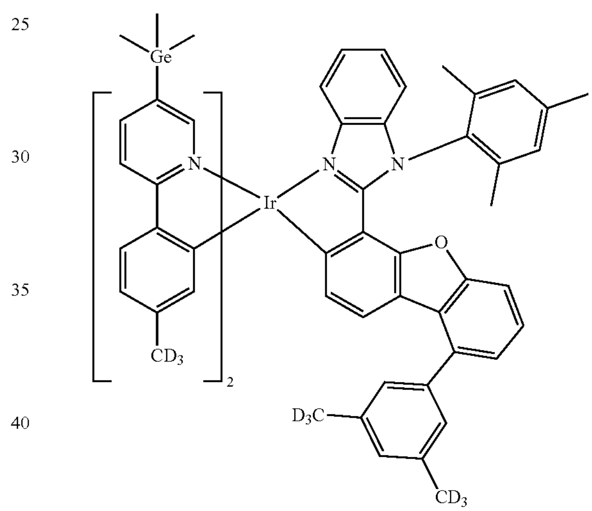
2672
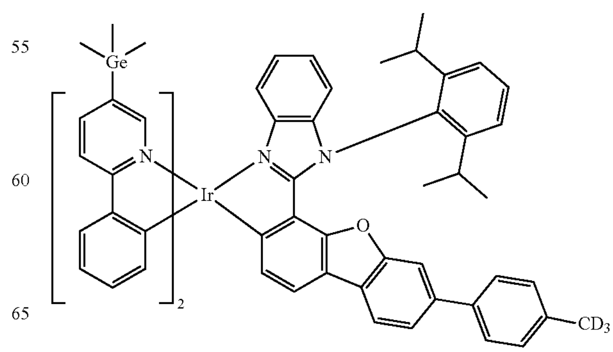

-continued
2673
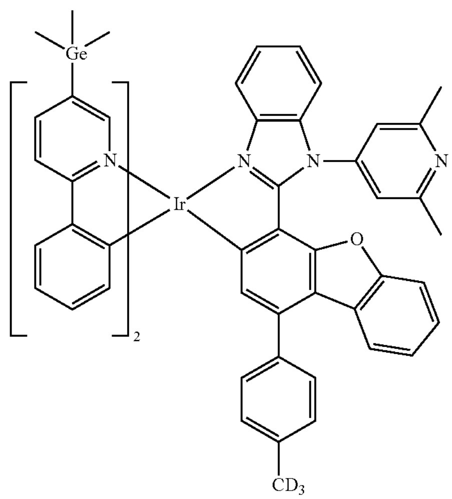
2674
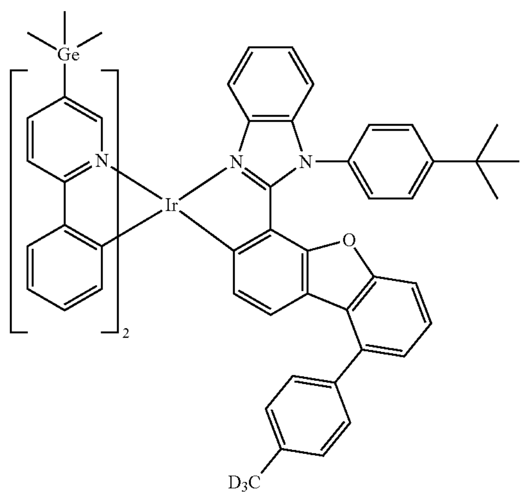
2675
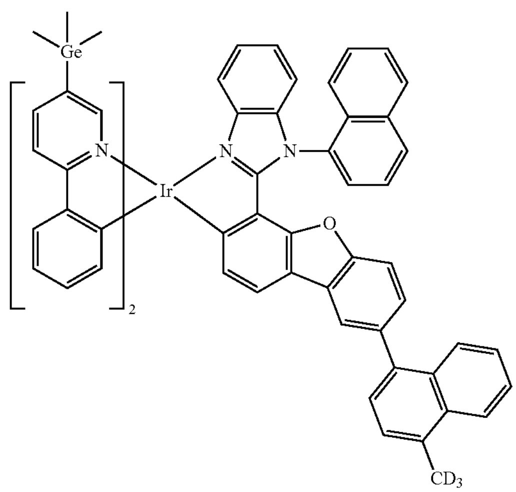
-continued
2676
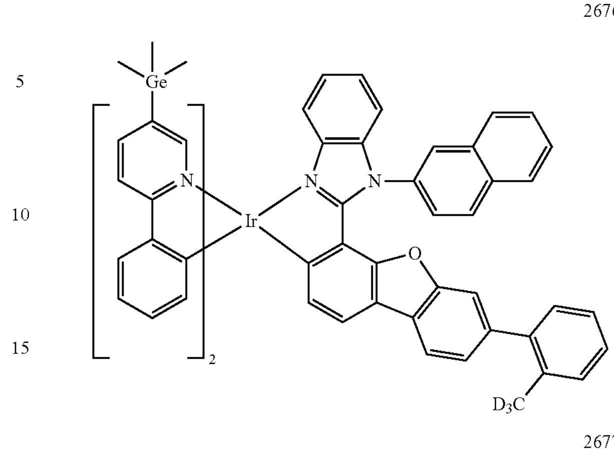
2677
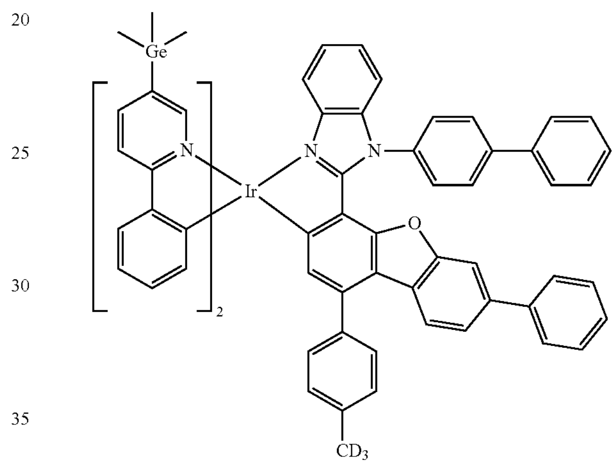
2678
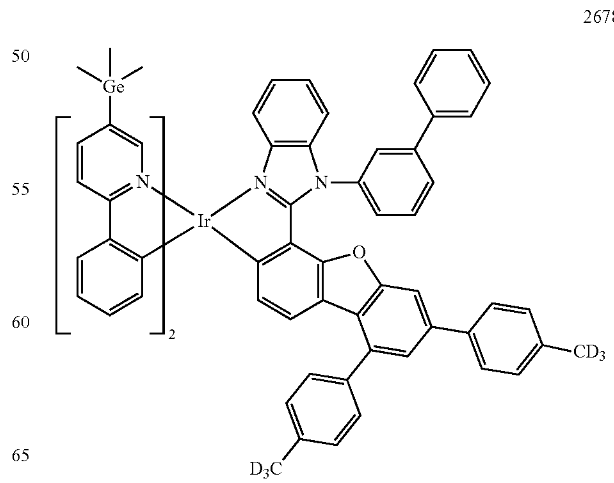

-continued
2679
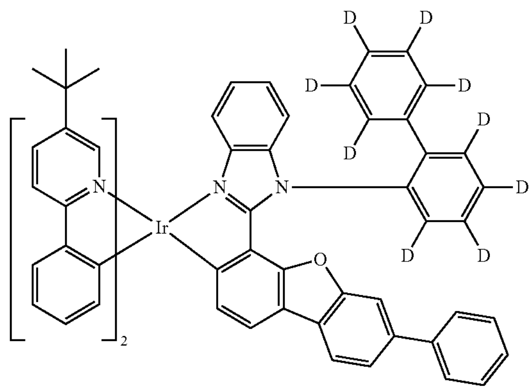
2680
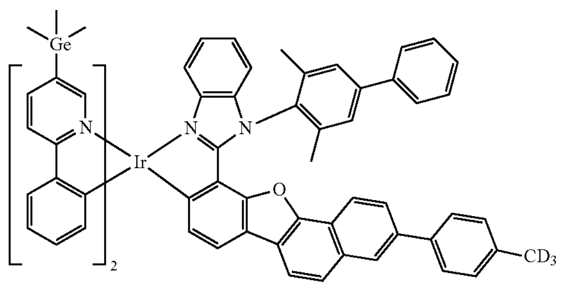
2681
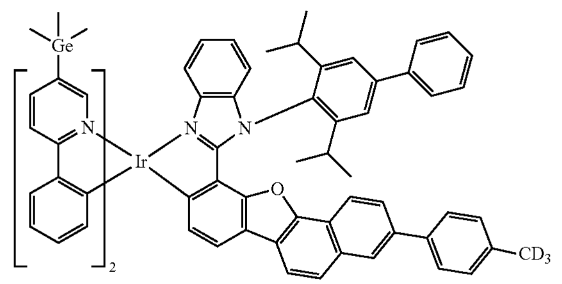
2682
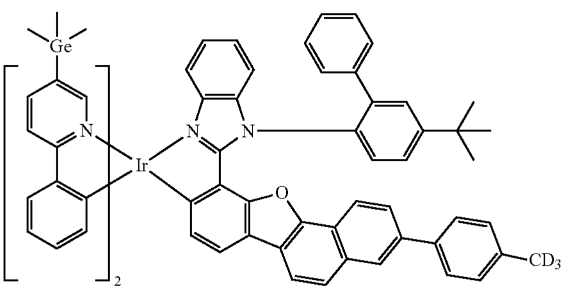
-continued
2683
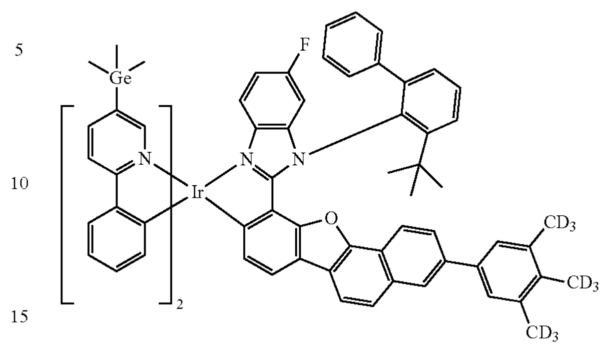
2684
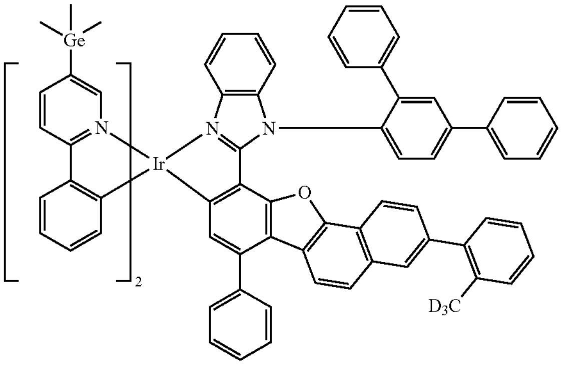
2685
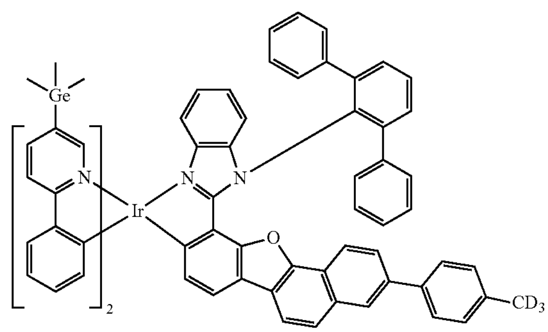

-continued
2686
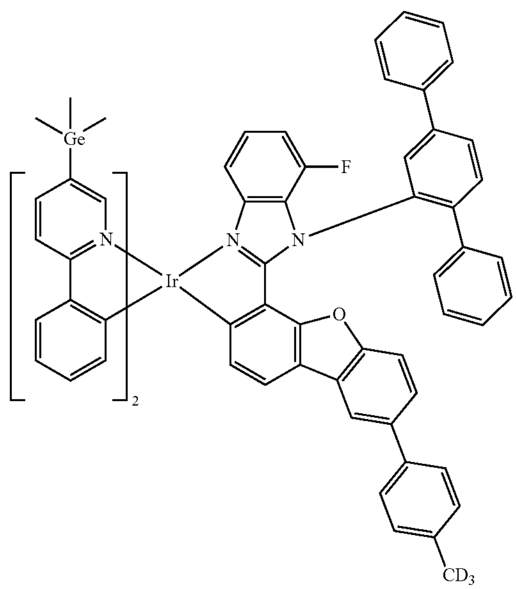
2687
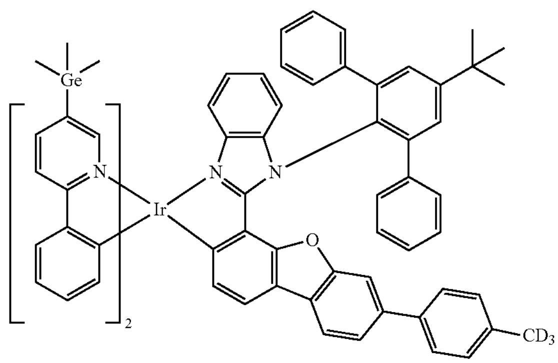
2688
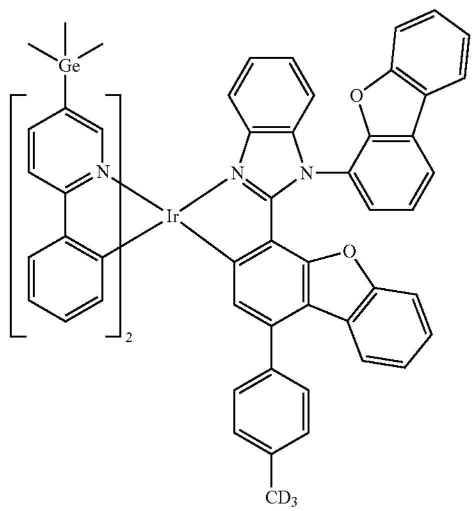
-continued
2689
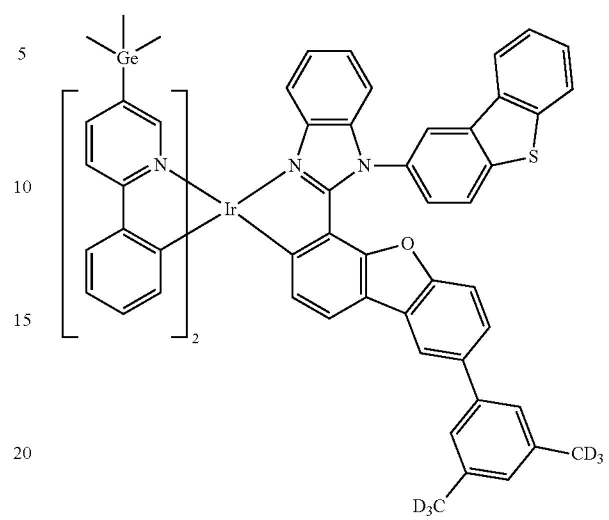
2690
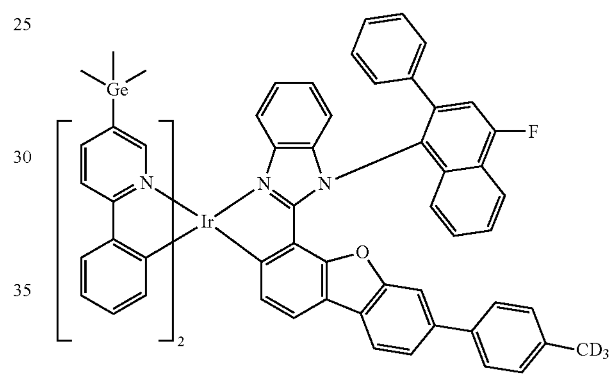
2691
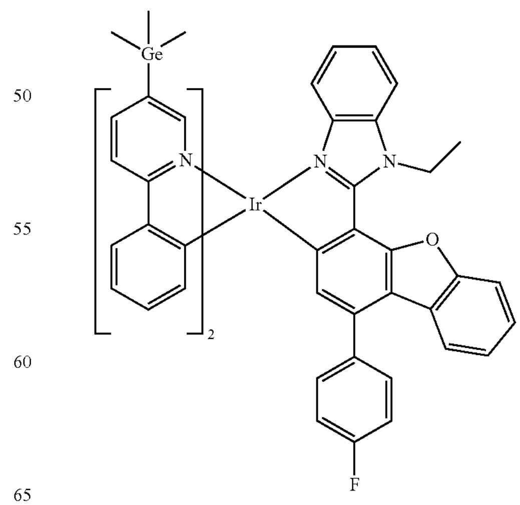

-continued
2692
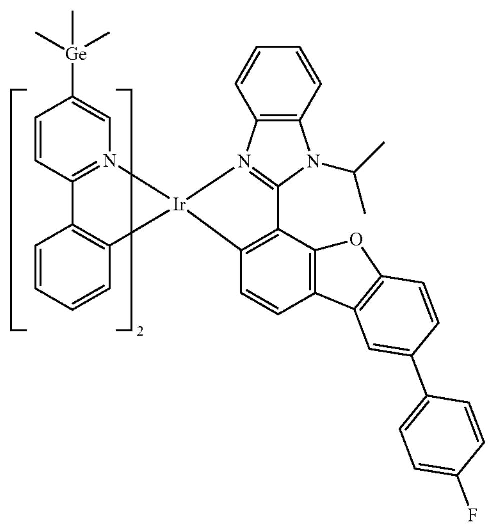
2693
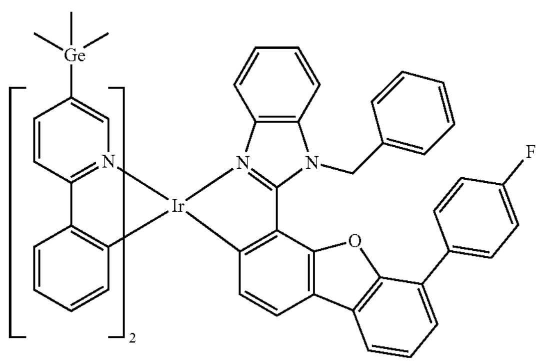
2694
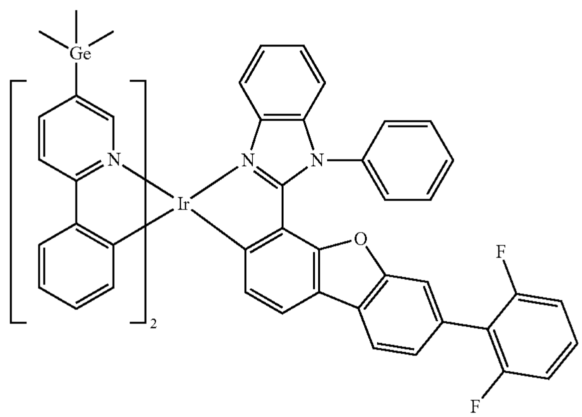
-continued
2695
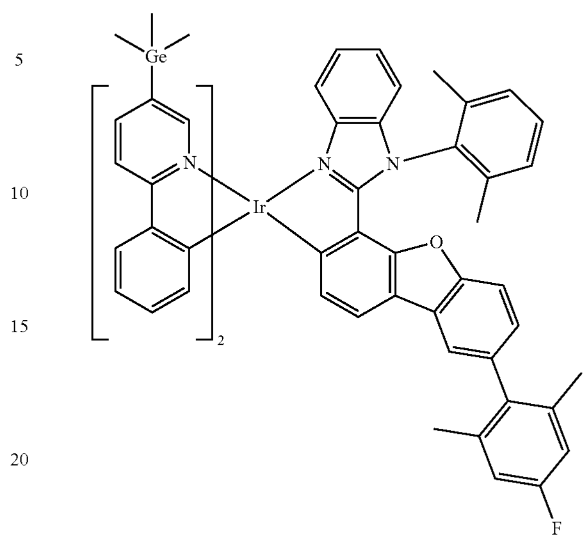
2696
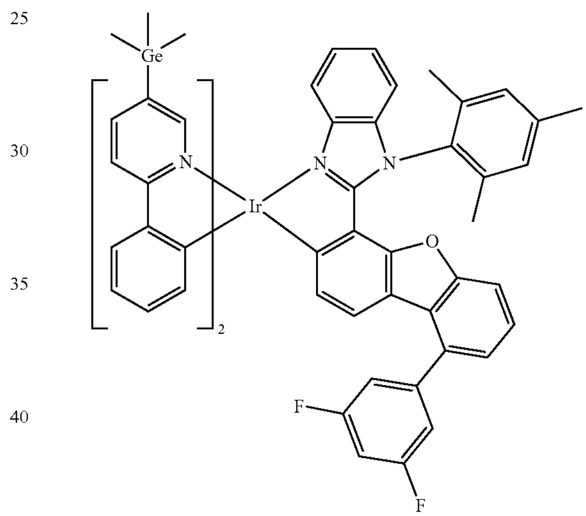
2697
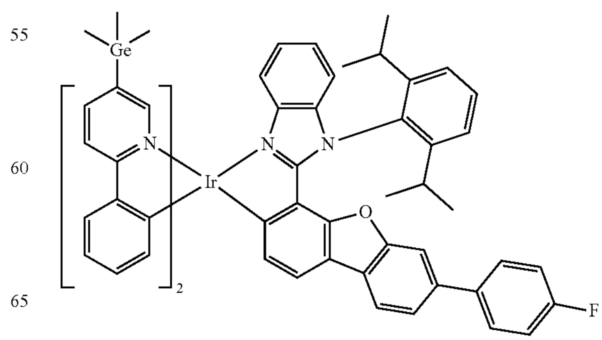

-continued
2698
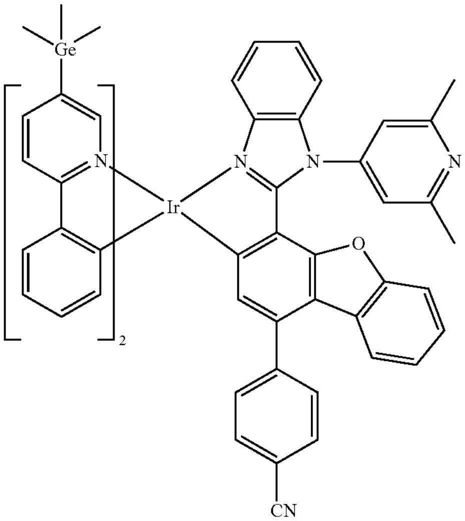
2699
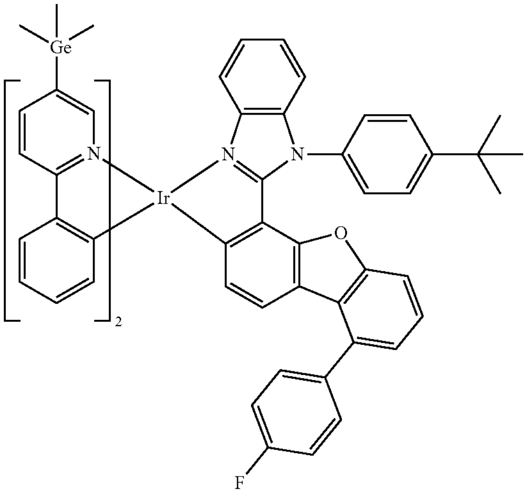
2700
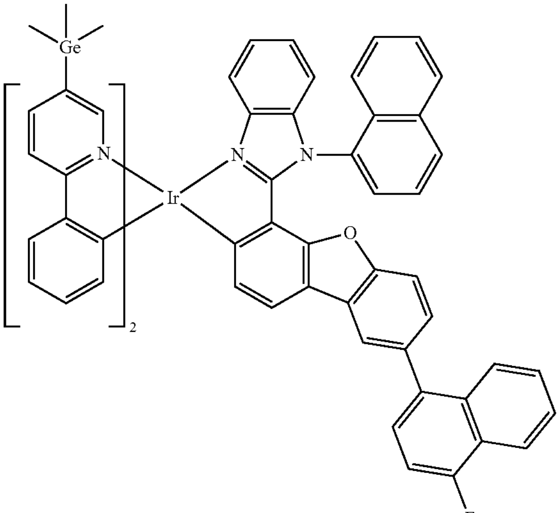
-continued
2701
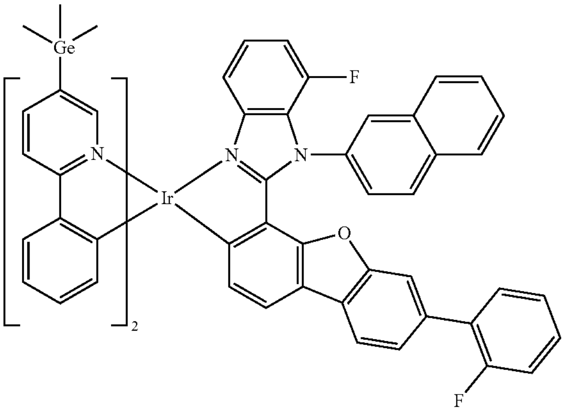
2702
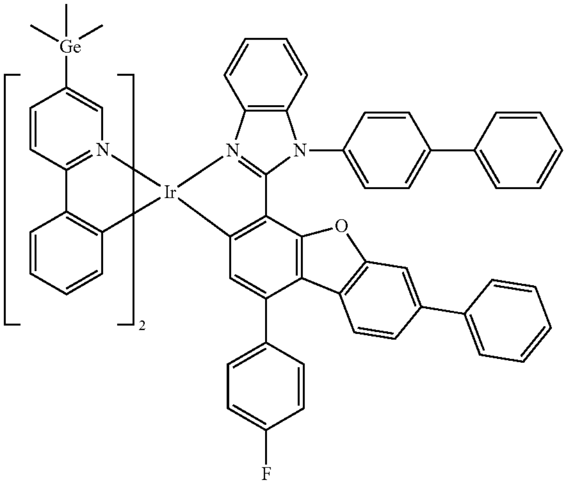
2703
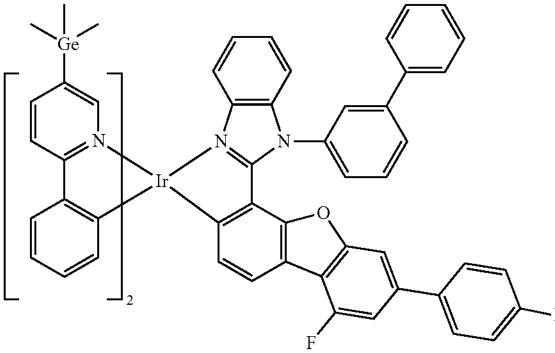
2704
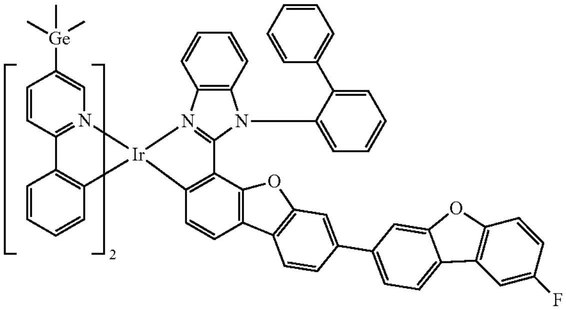

-continued
2705
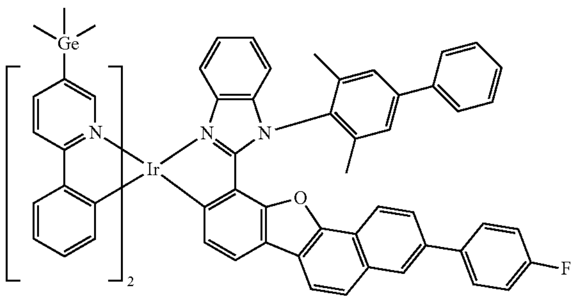
2706
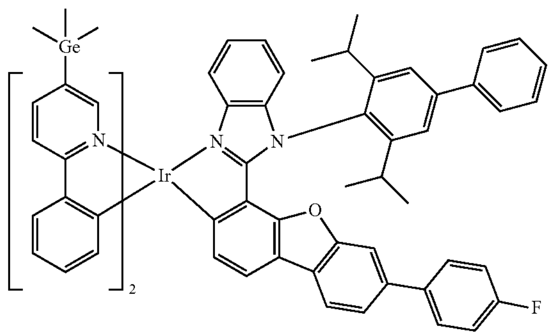
2707
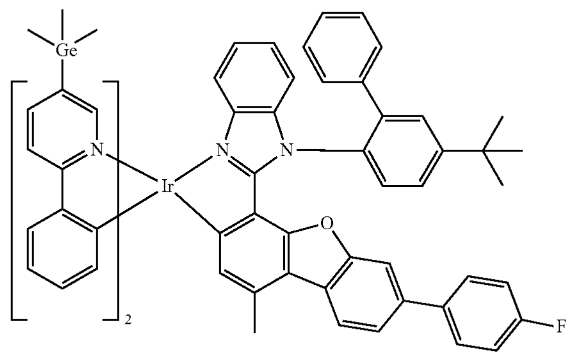
2708
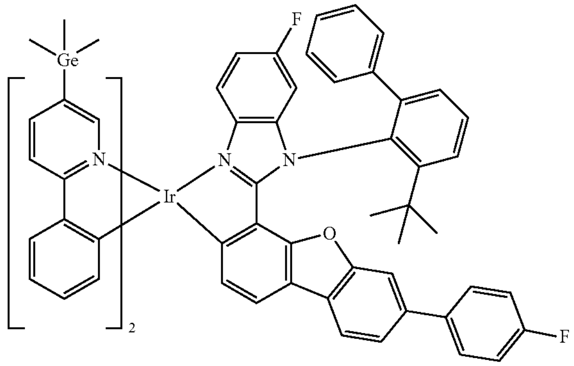
-continued
2709
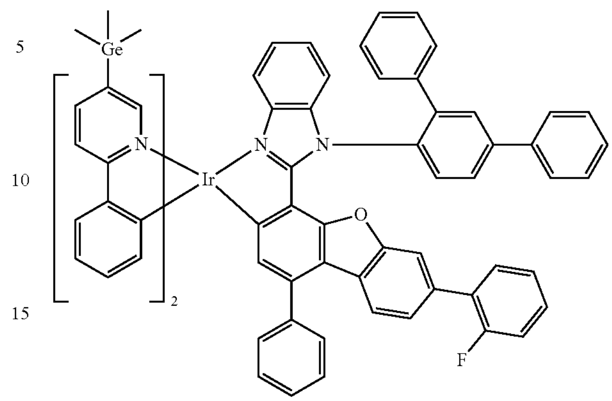
2710
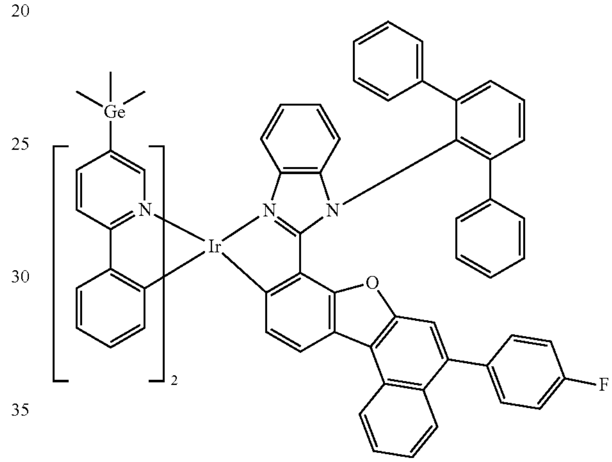
2711
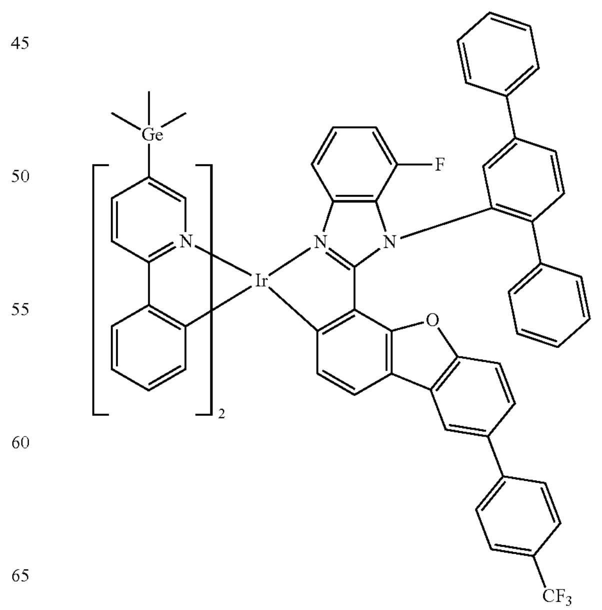

2712
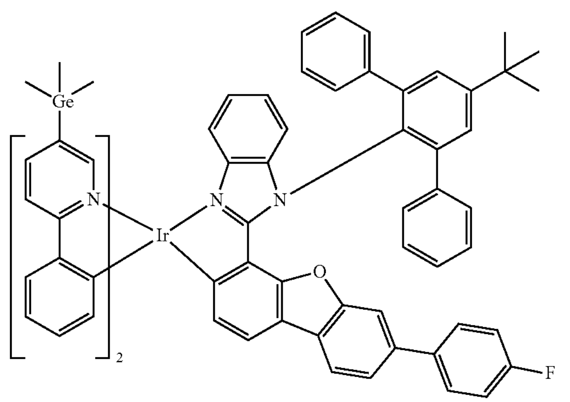
2713
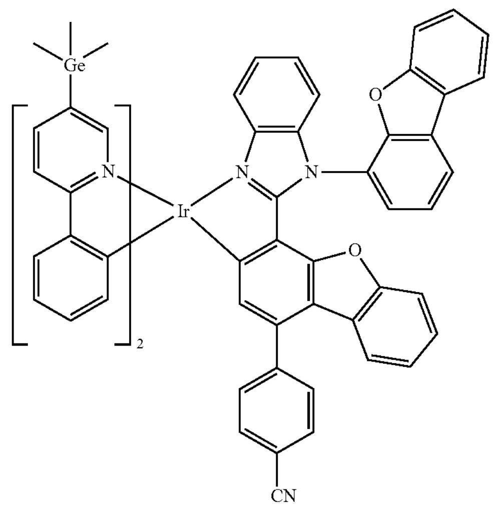
2714
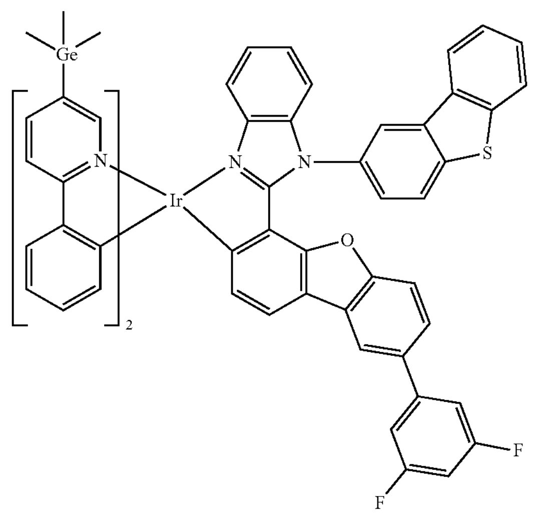
2715
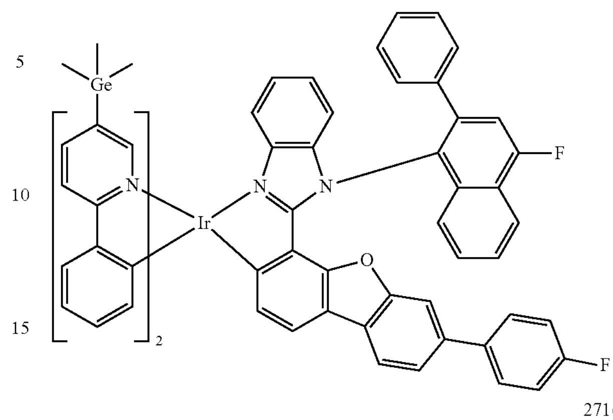
2716
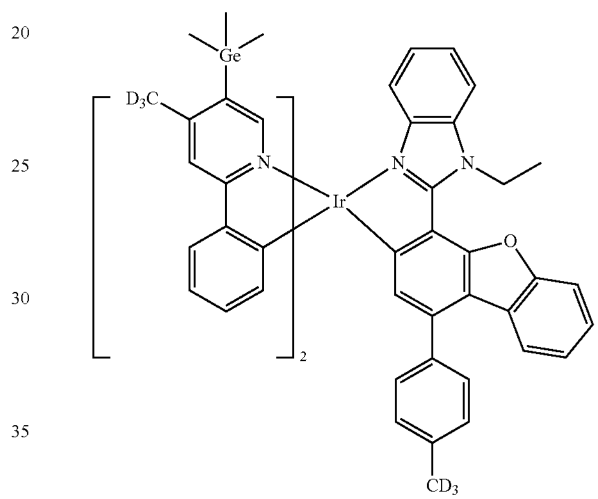
2717
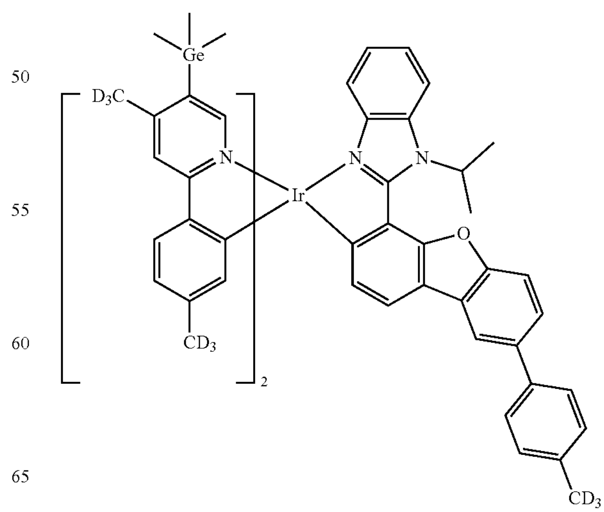

-continued
2718
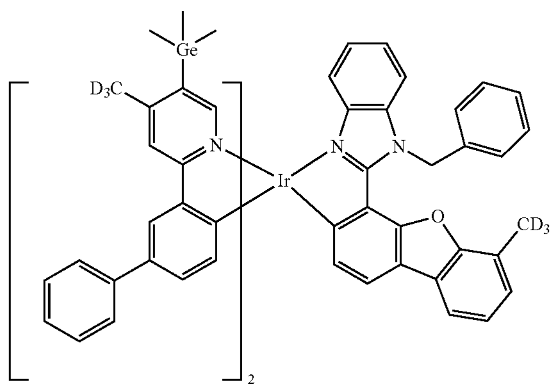
2719
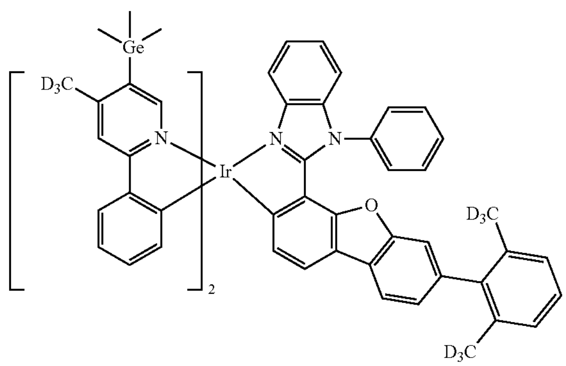
2720
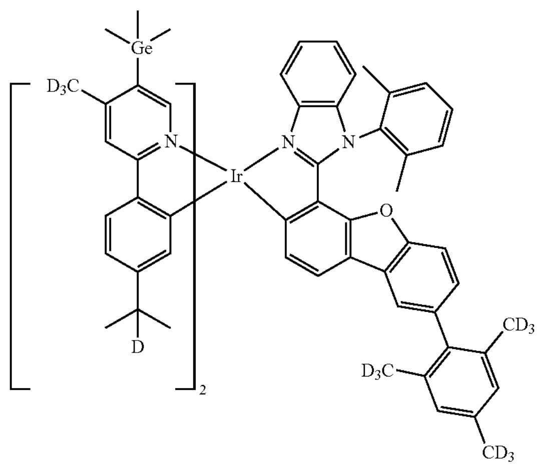
-continued
2721
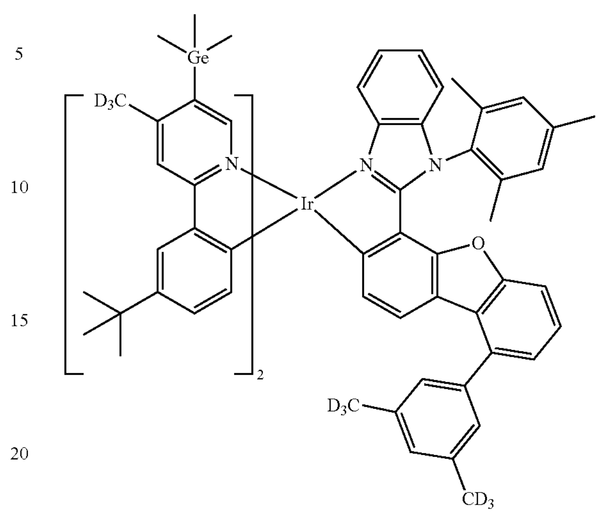
2722
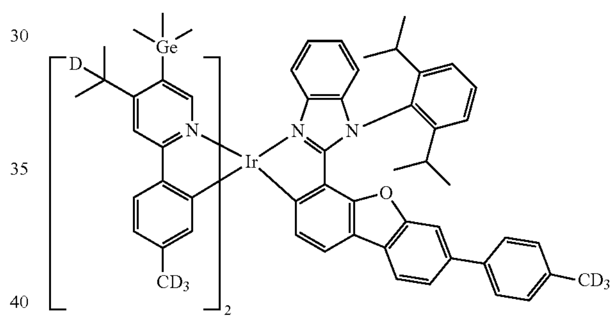
2723
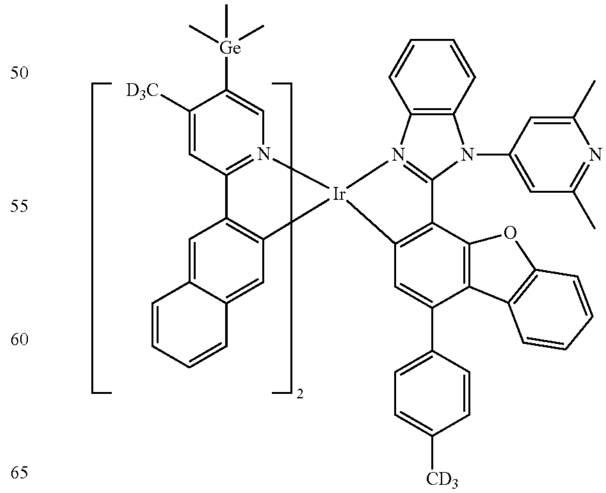

-continued
2724
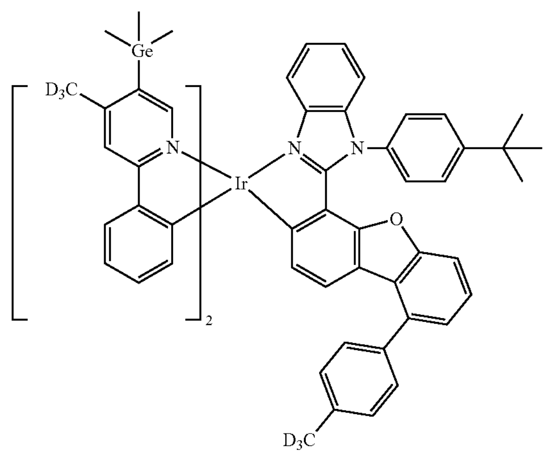
2725
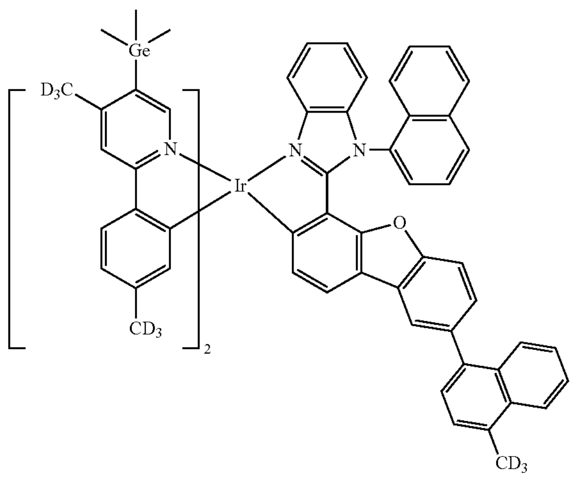
2726
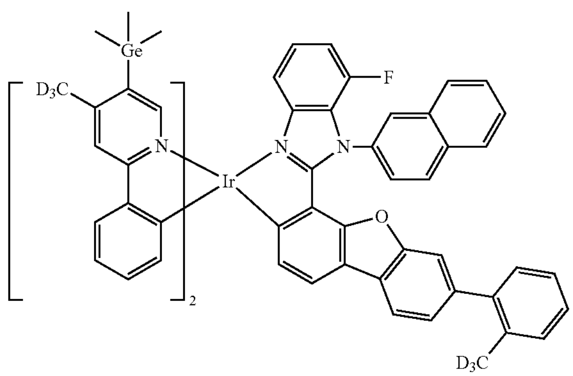
-continued
2727
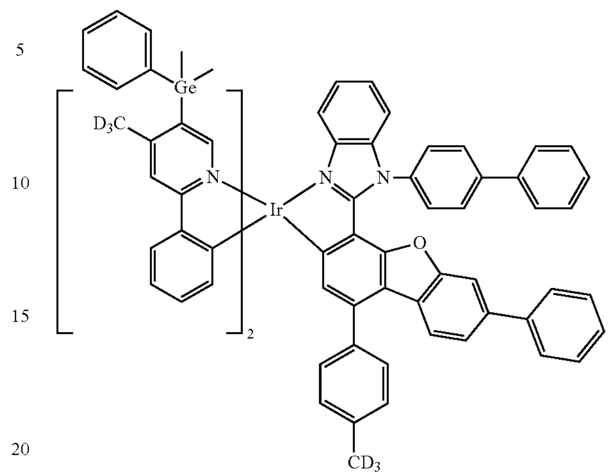
2728
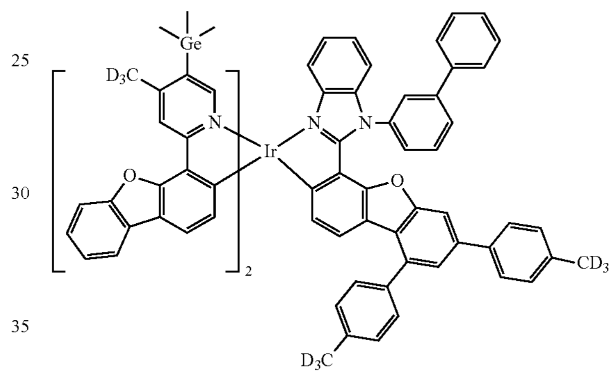
2729
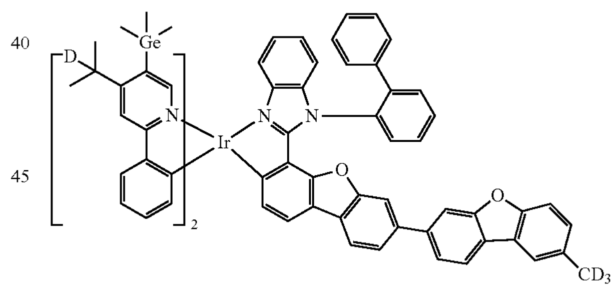
2730
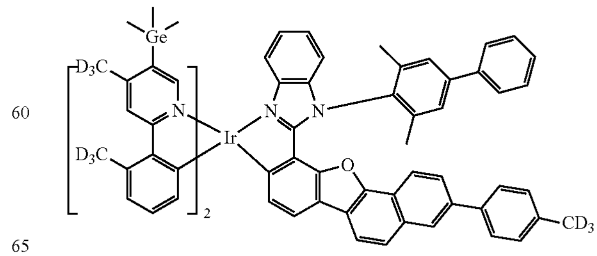

2731
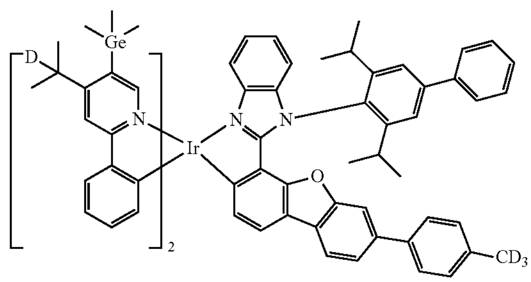
2722
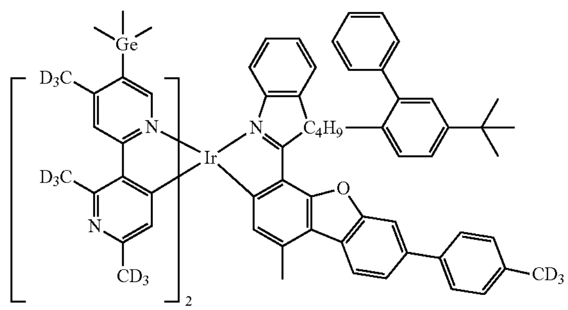
2723
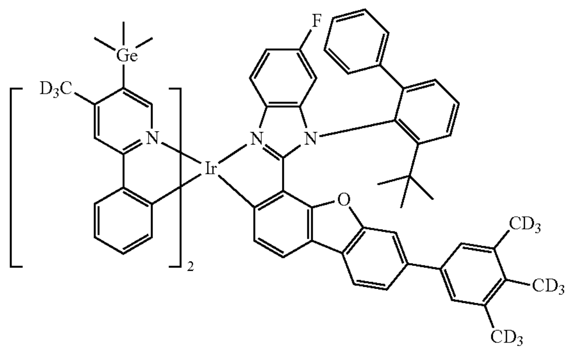
2724
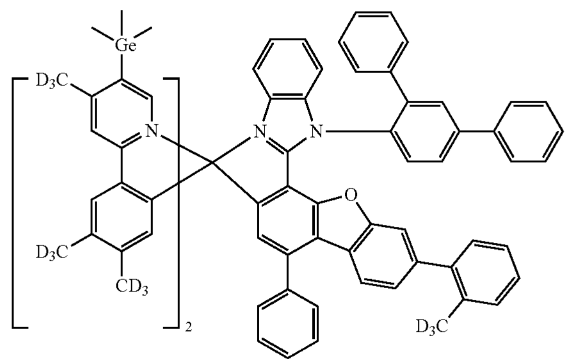
2725
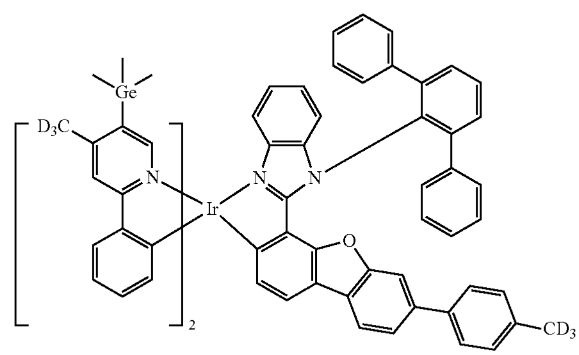
2736
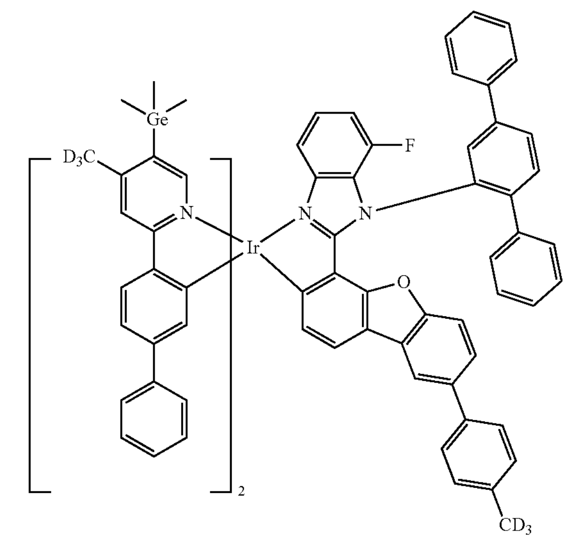
2737
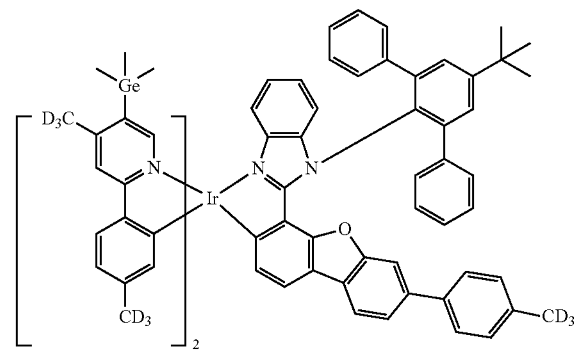

-continued
2738
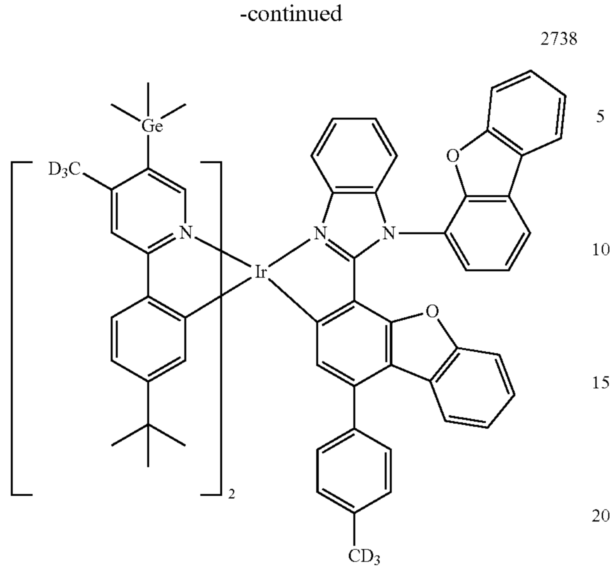
2739
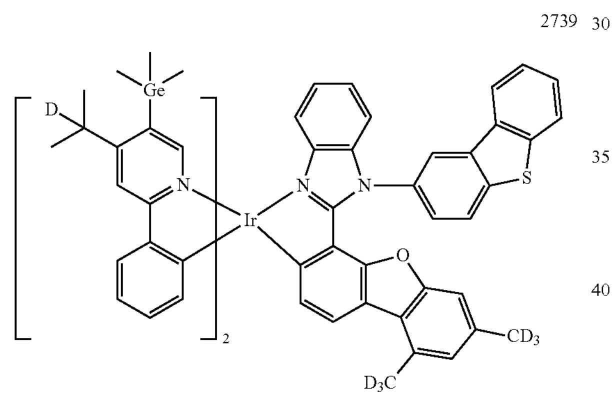
2740
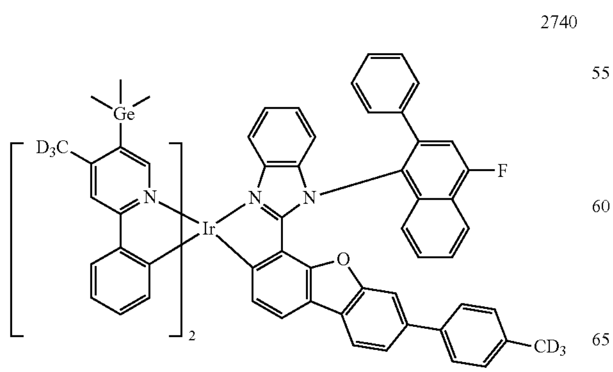
-continued
2741
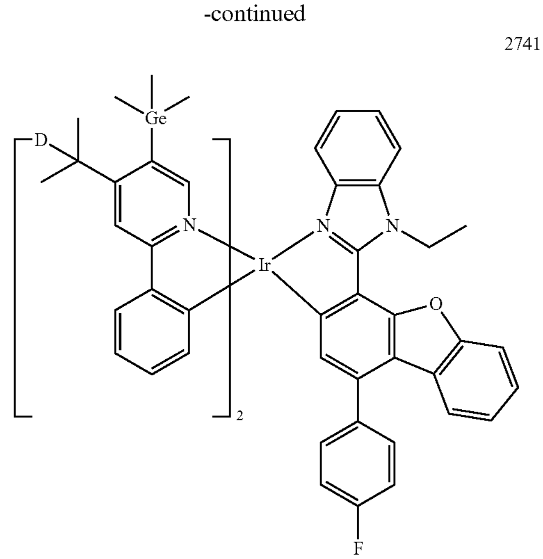
2742
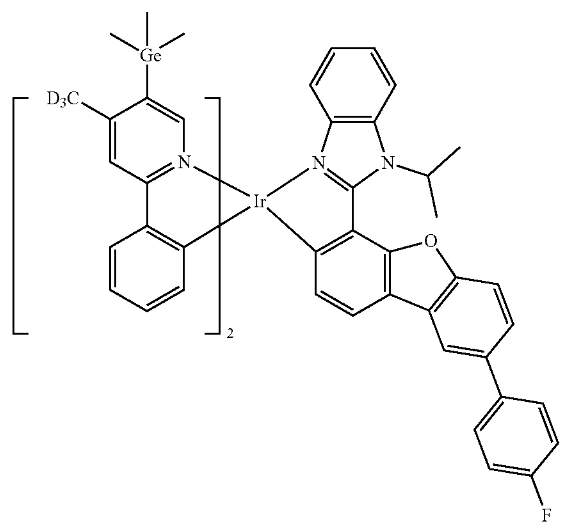
2743
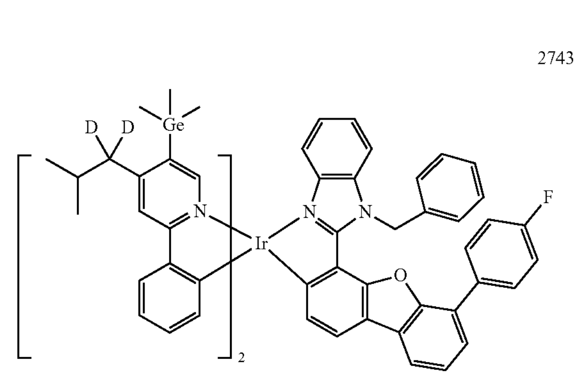

-continued
2744
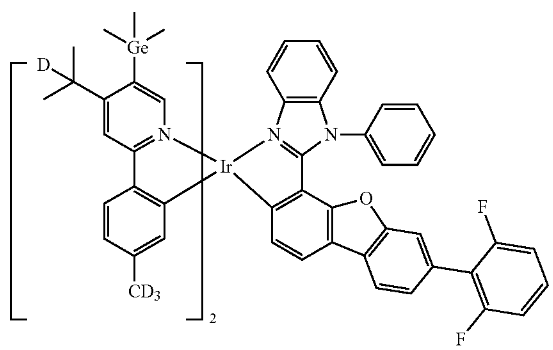
2745
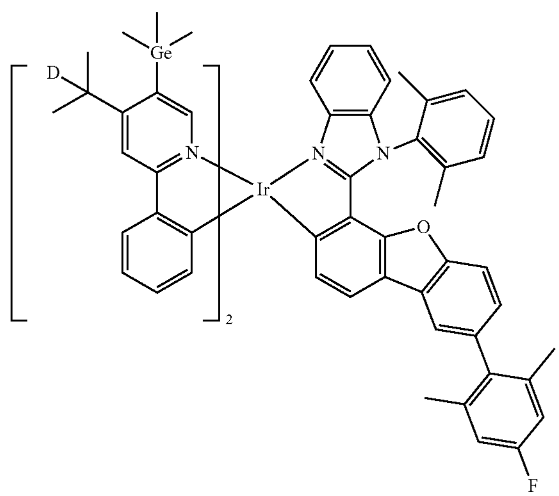
2746
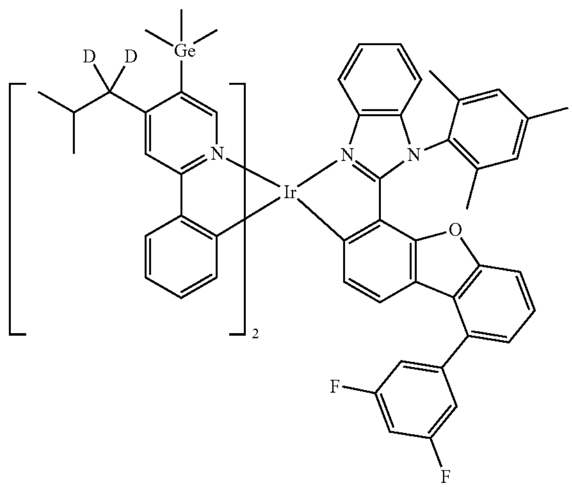
-continued
2747
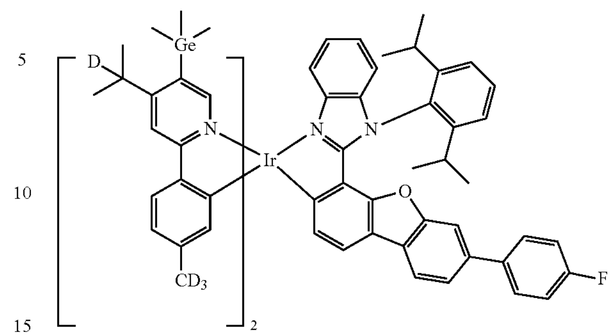
2748
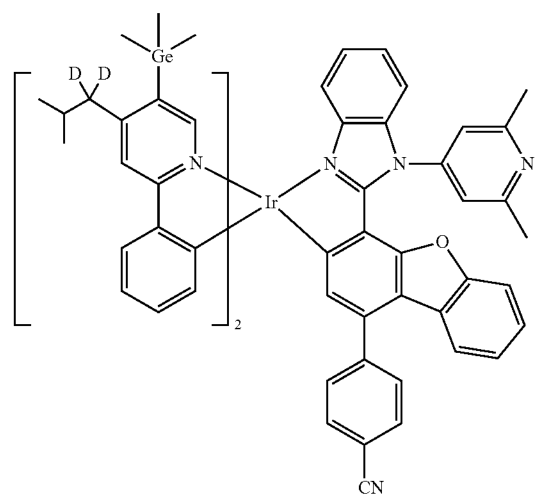
2749
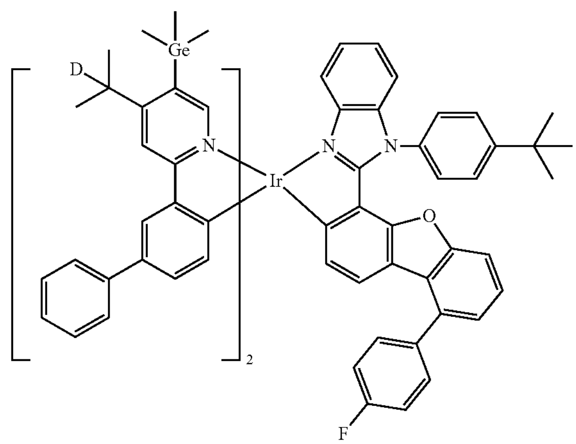

-continued
2750
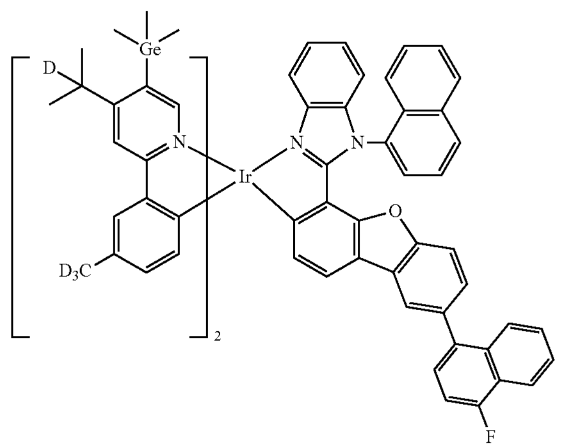
2751
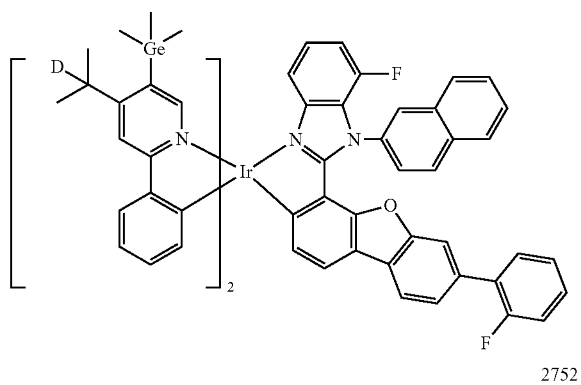
2752
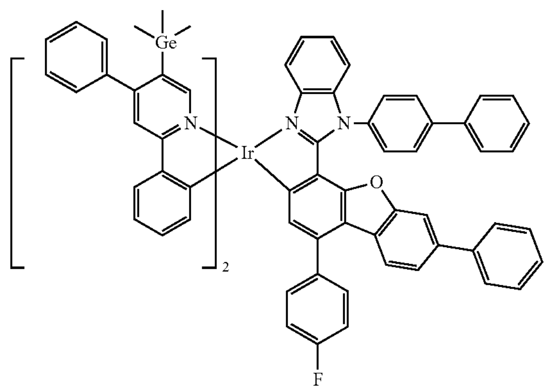
2753
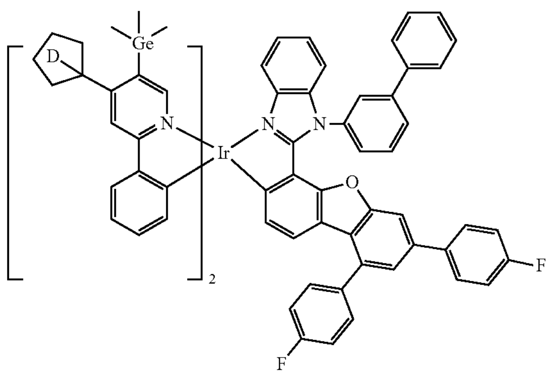
-continued
2754
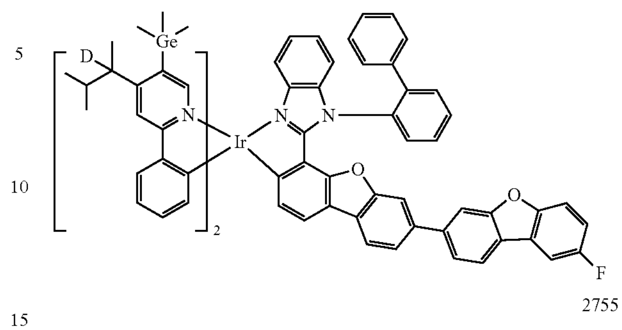
2755
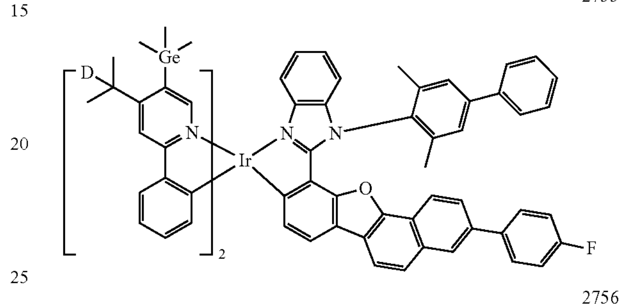
2756
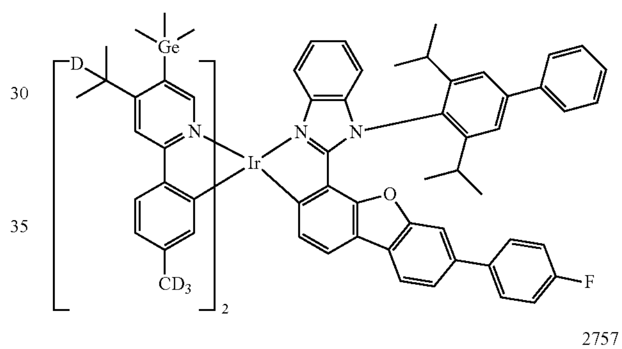
2757
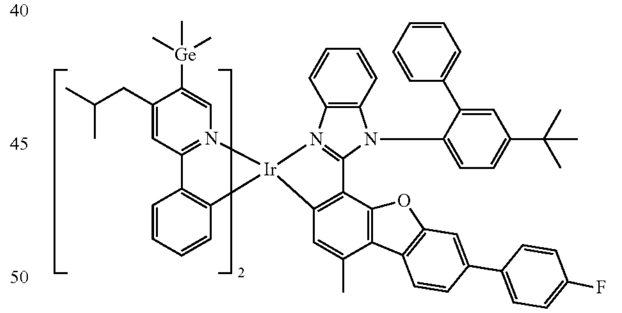
2758
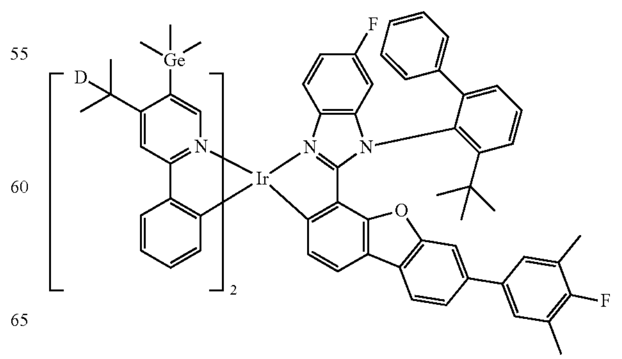

-continued
2759
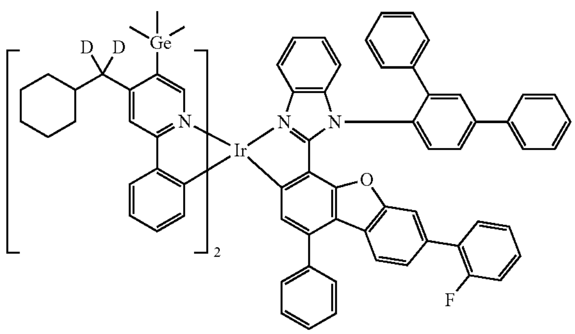
2760
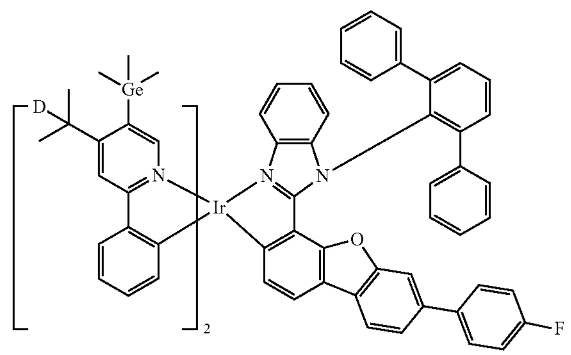
2761
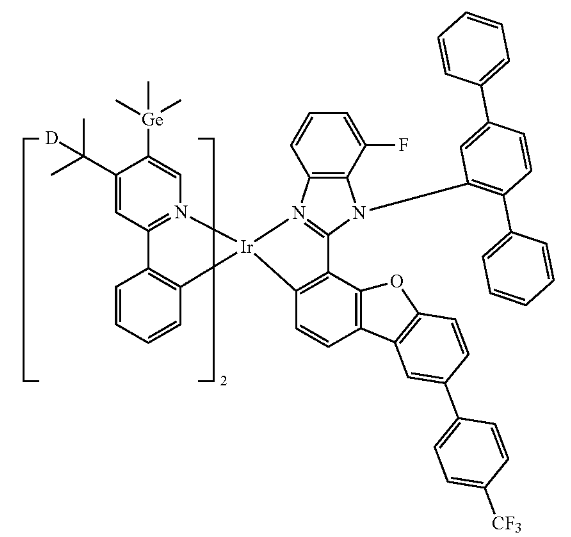
2762
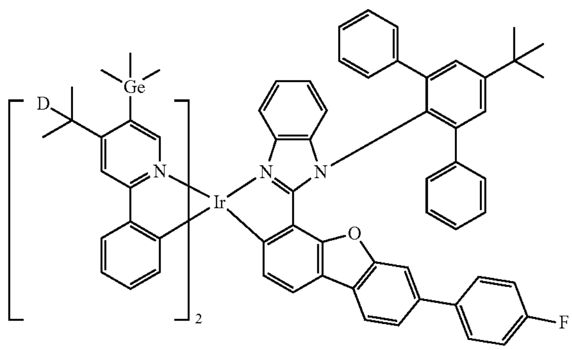
-continued
2763
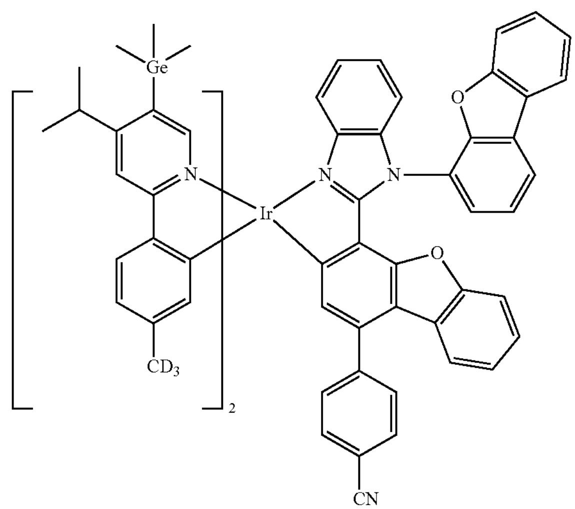
2764
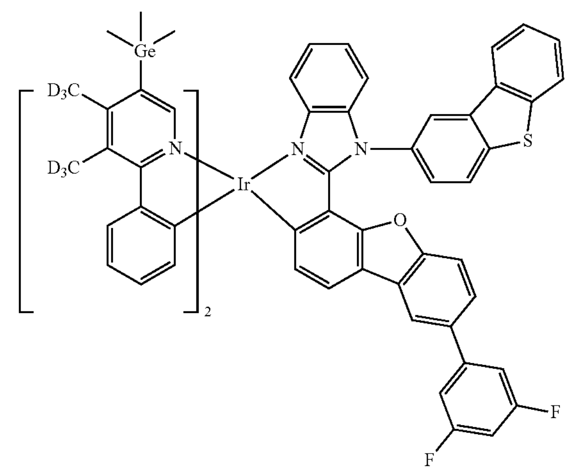
2765
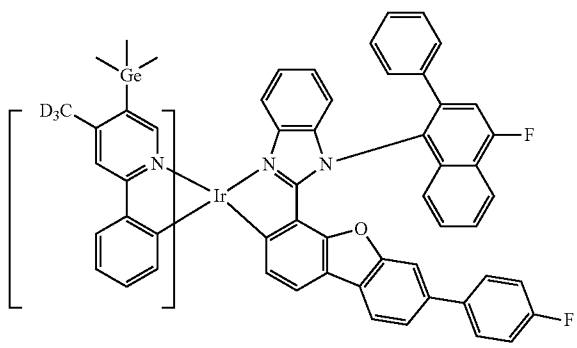

-continued
2866
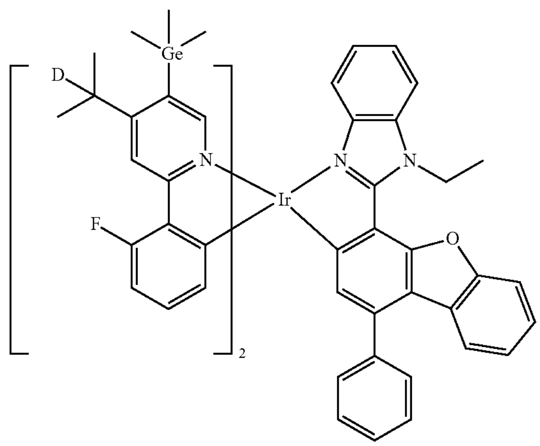
2867
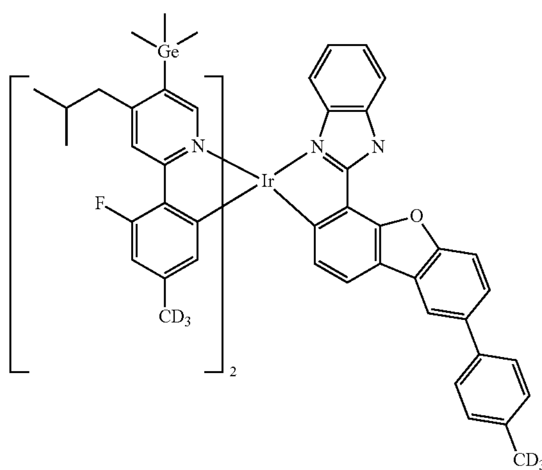
2868
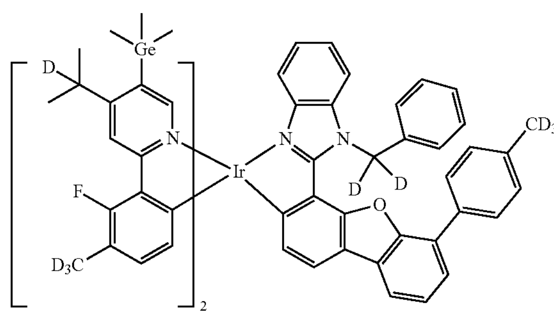
2869
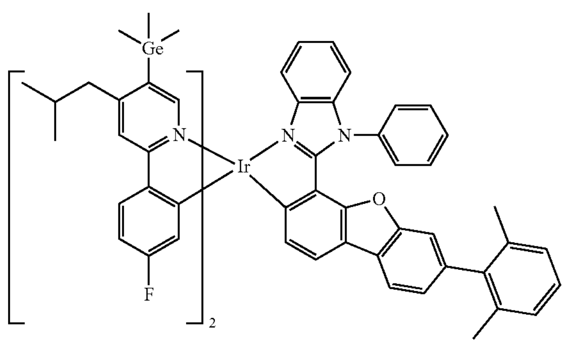
-continued
2770
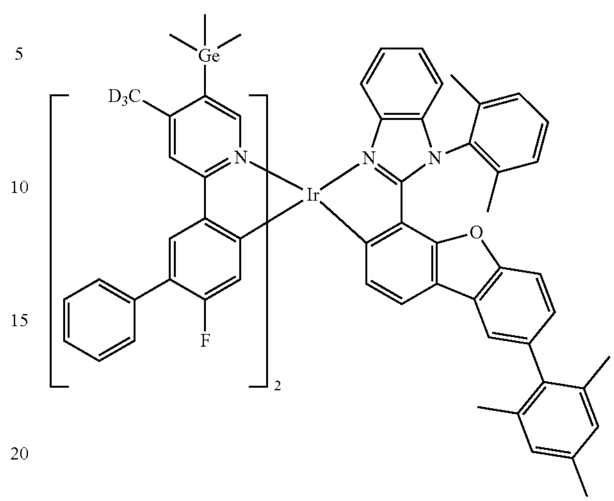
2771
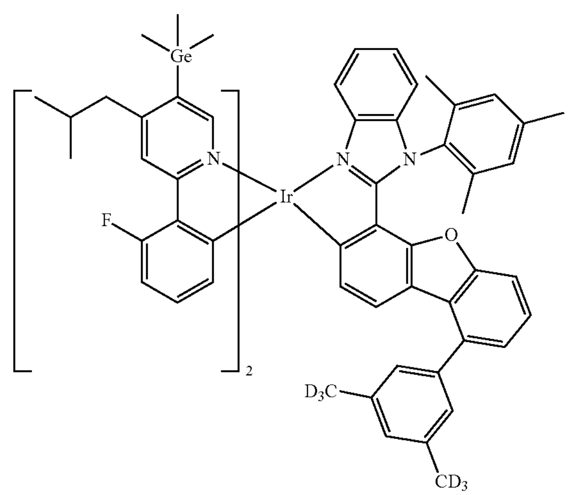
2772
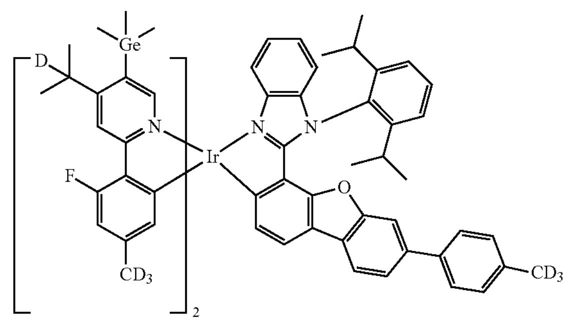

-continued
2773
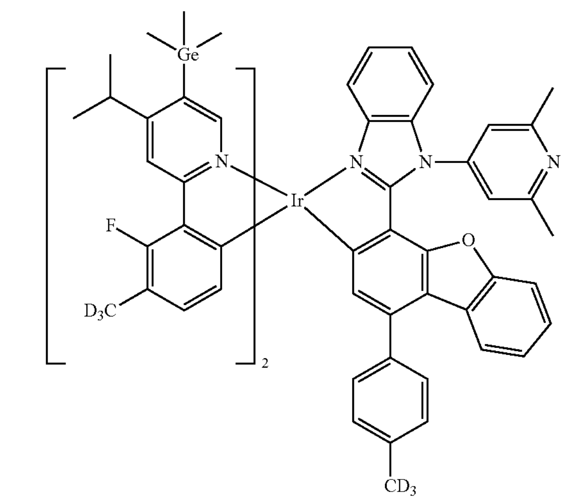
2774
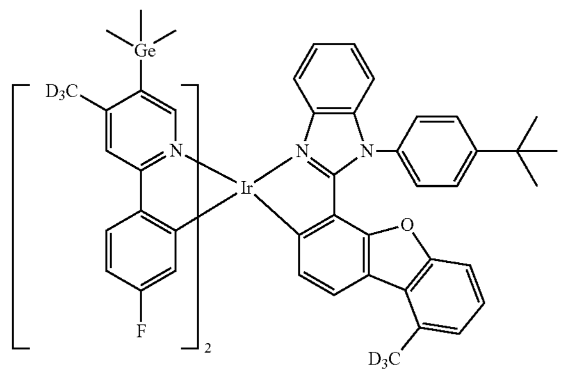
2775
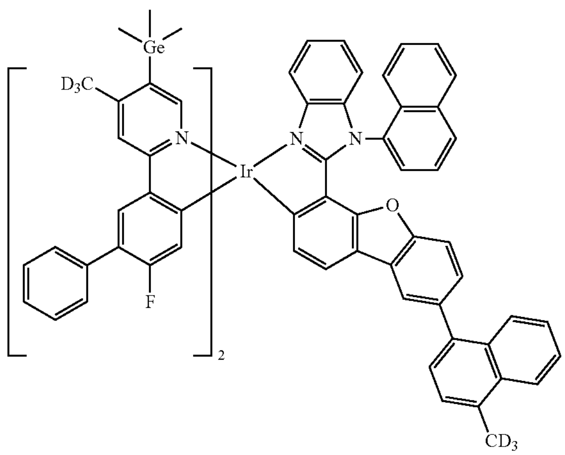
-continued
2776
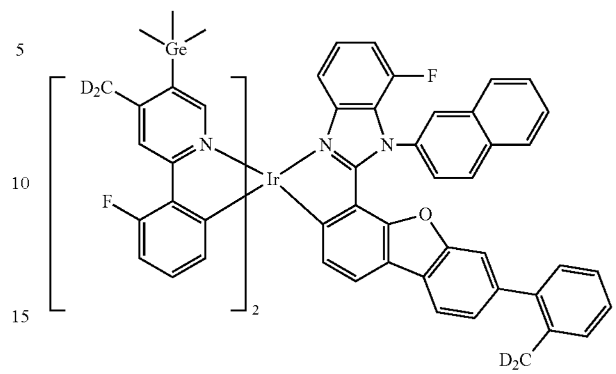
2777
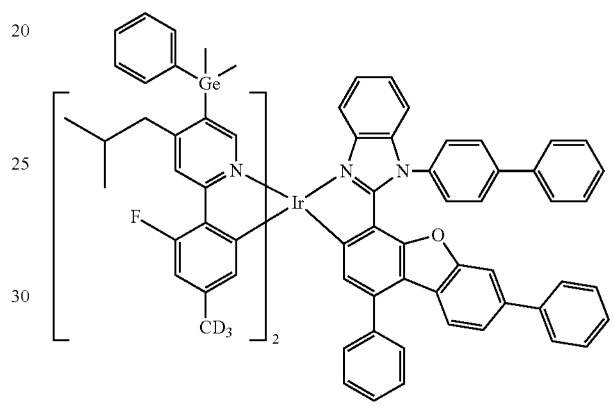
2779
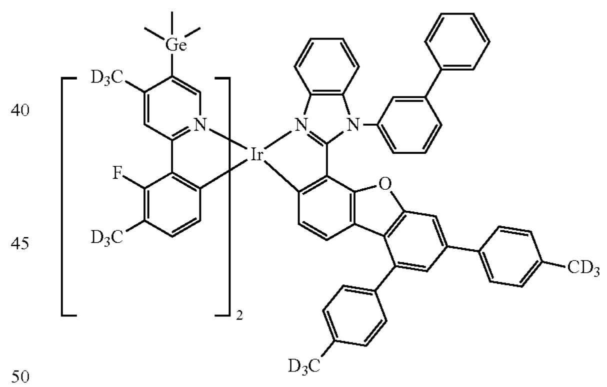
2780
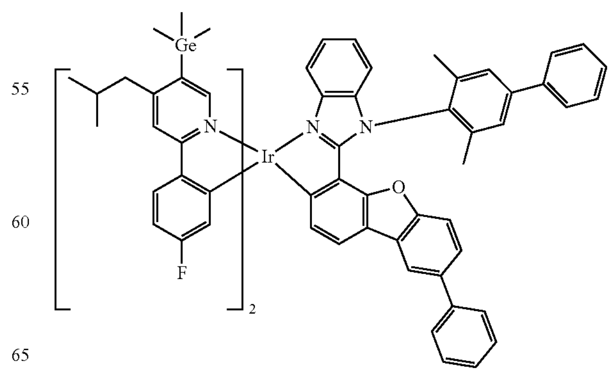

-continued
2781
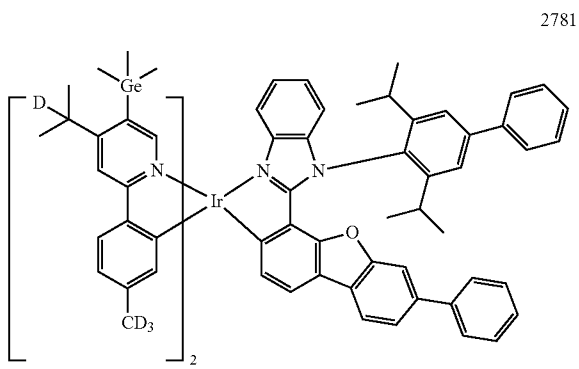
2782
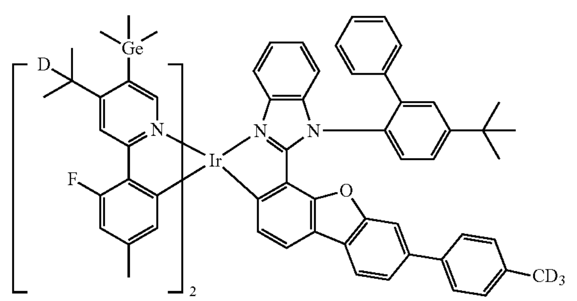
2783
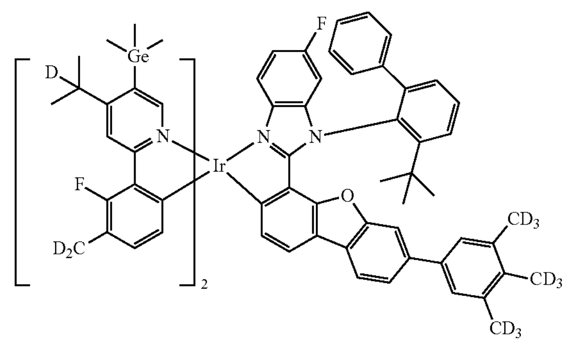
2784
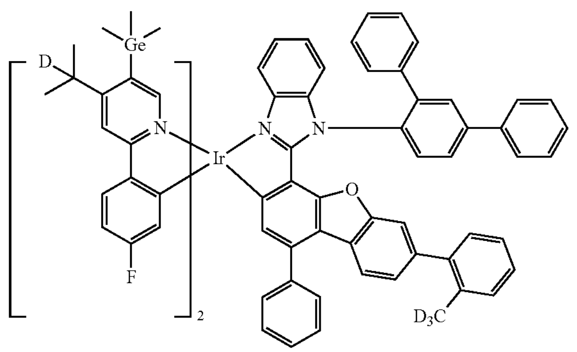
-continued
2785
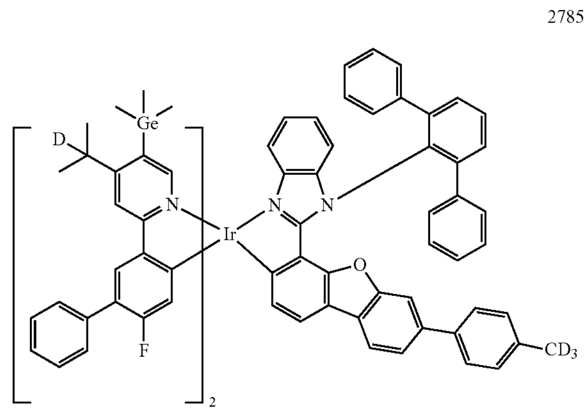
2786
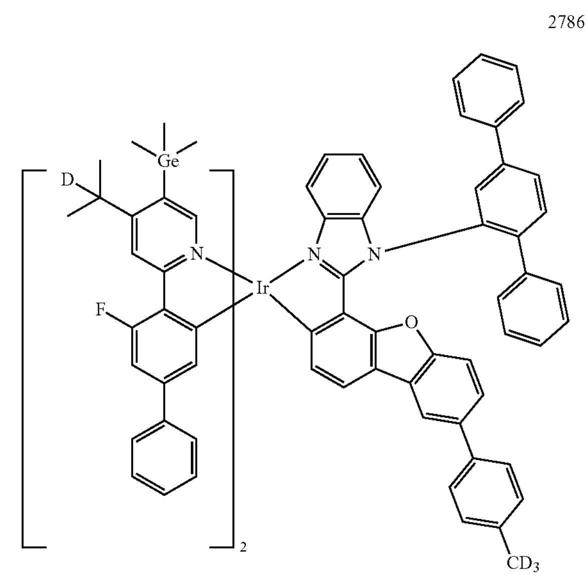
2787
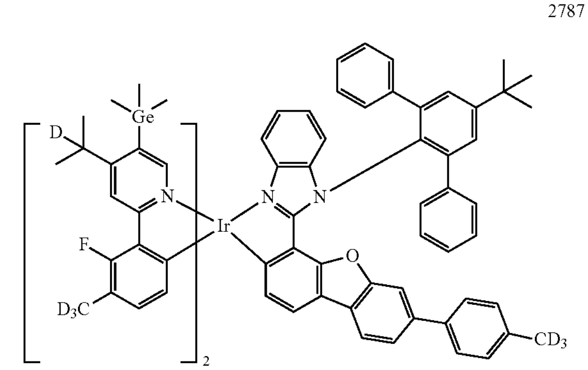

-continued
2788
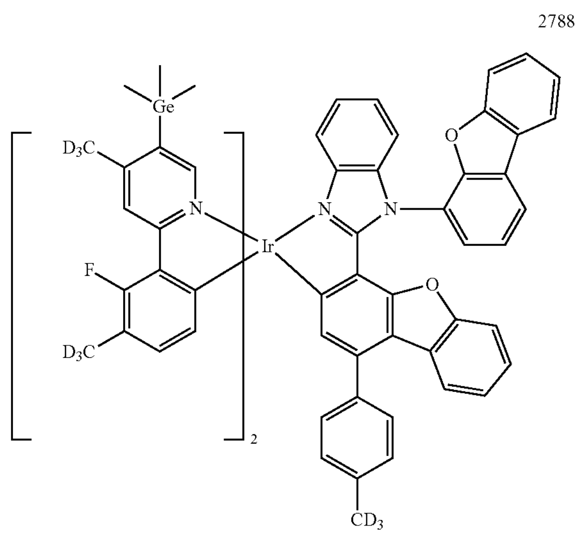
2789
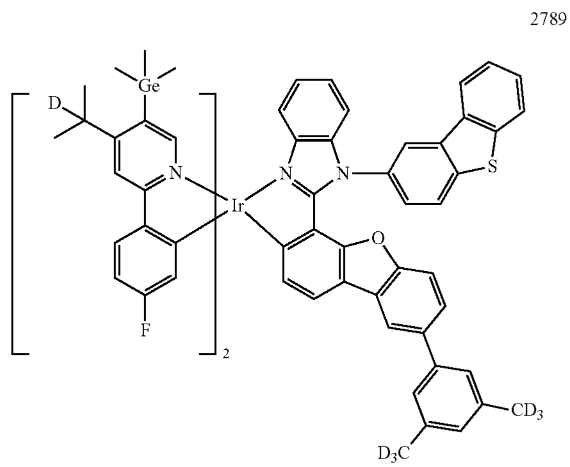
2790
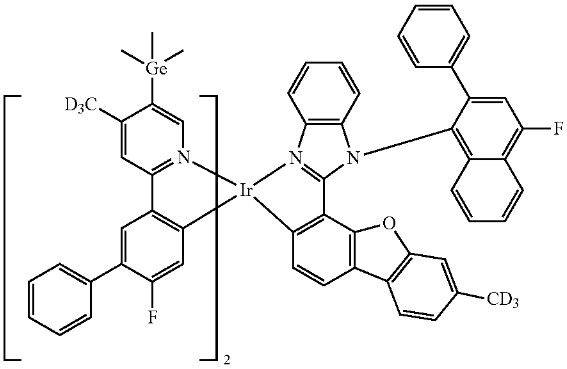
-continued
2791
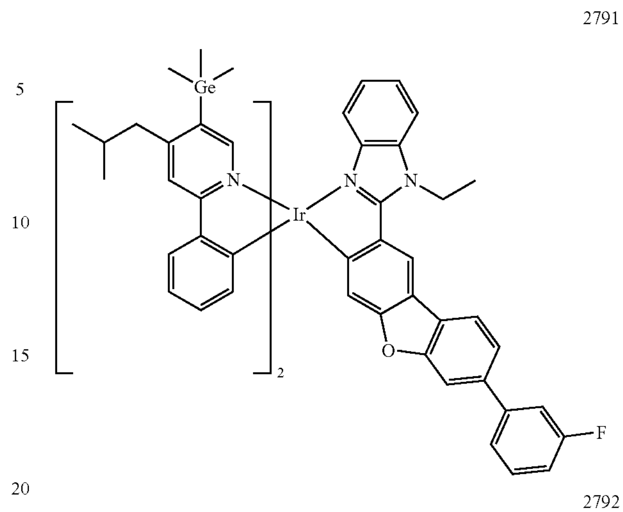
2792
2793
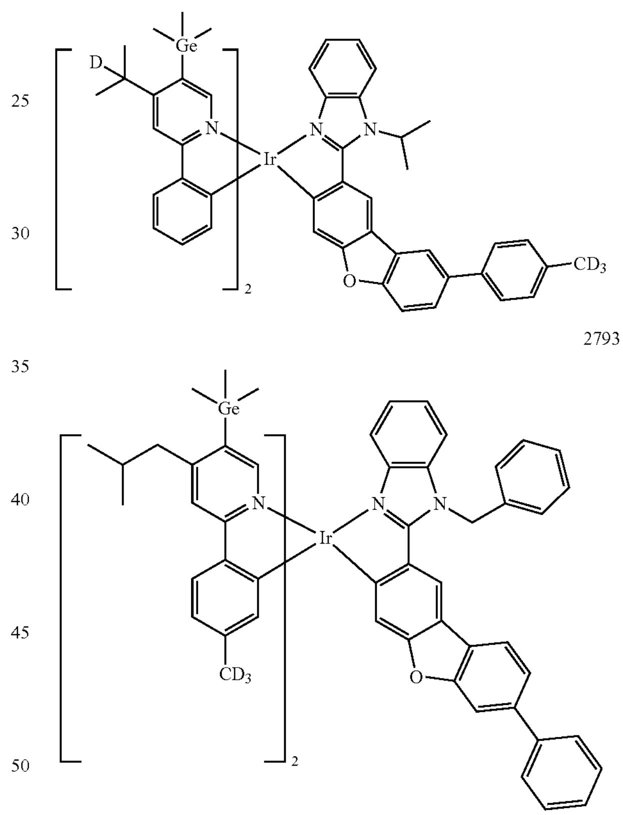
2794
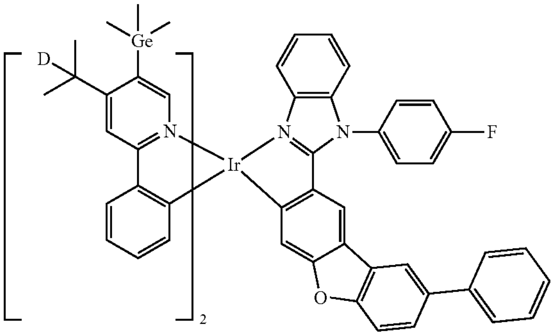

-continued
2795
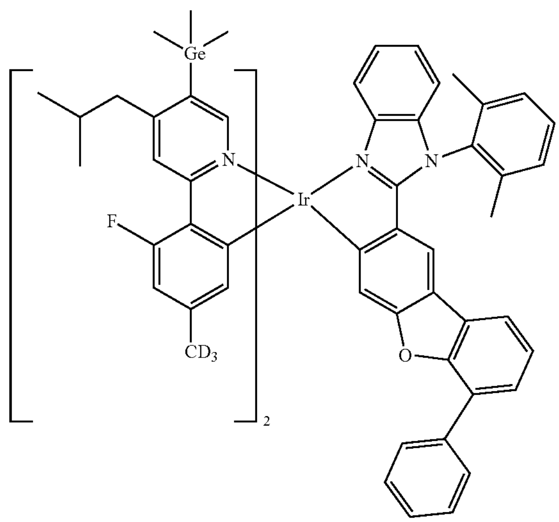
2796
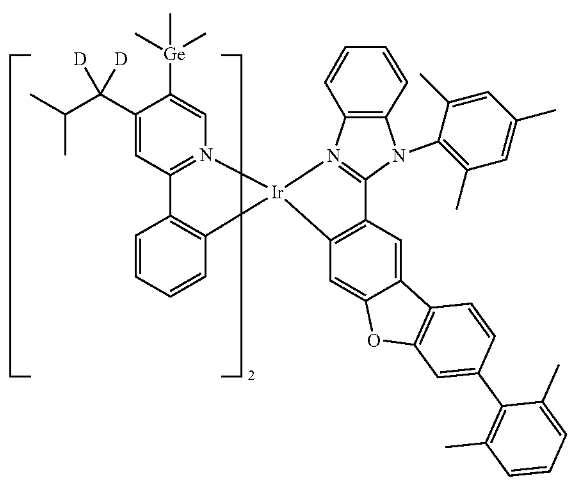
2797
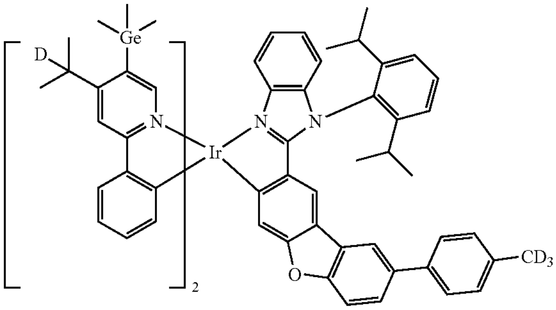
-continued
2798
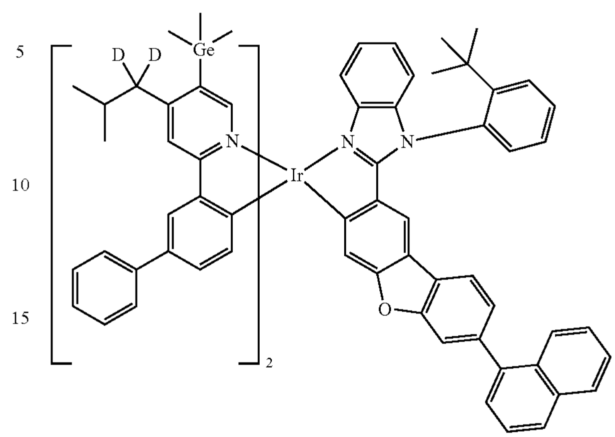
2799
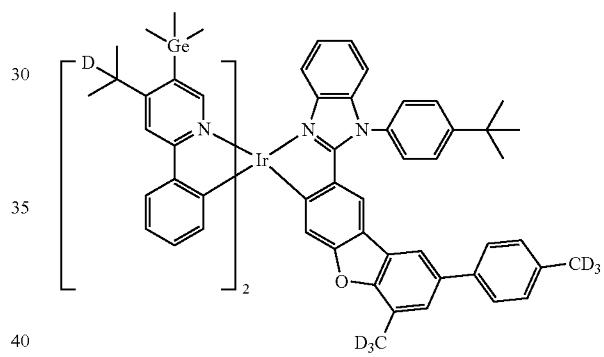
2800
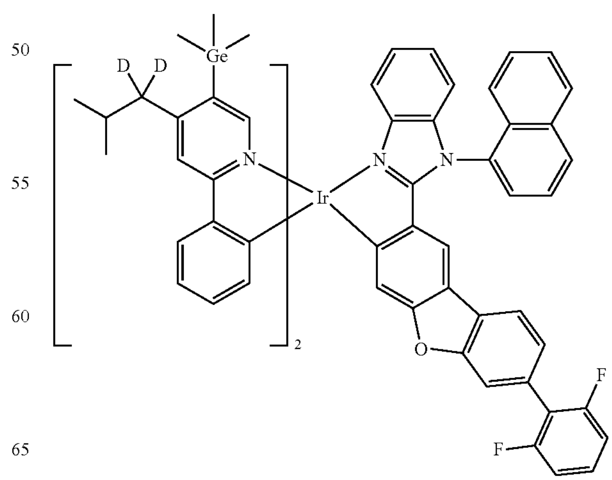

-continued
2801
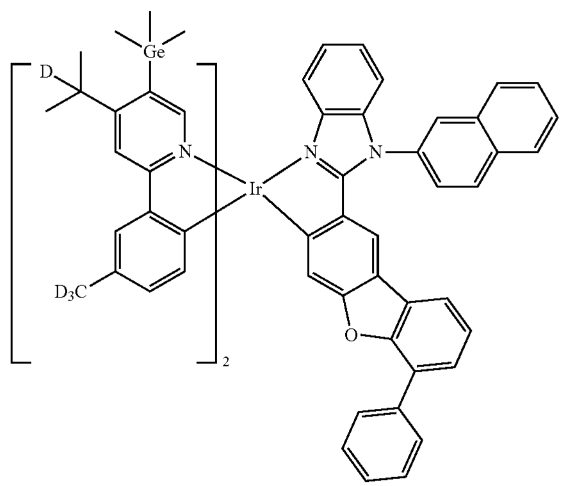
2802
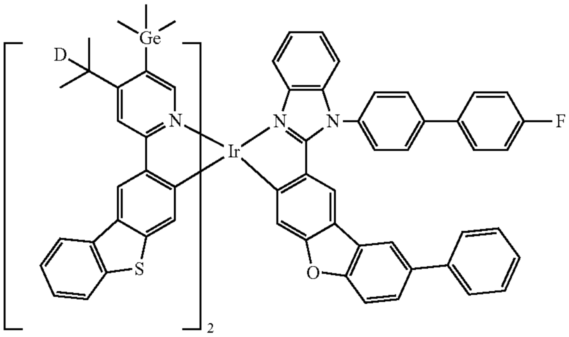
2803
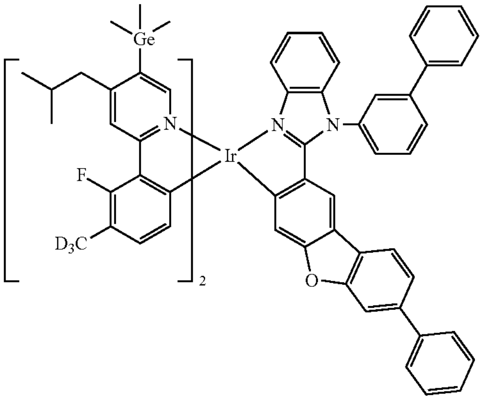
2804
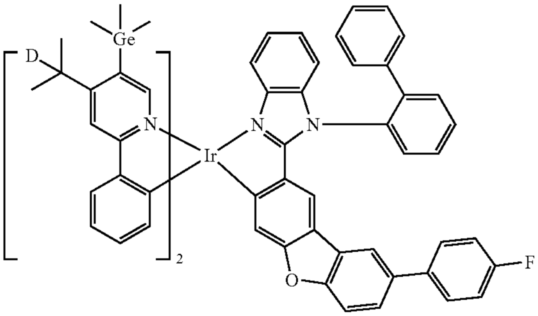
-continued
2805
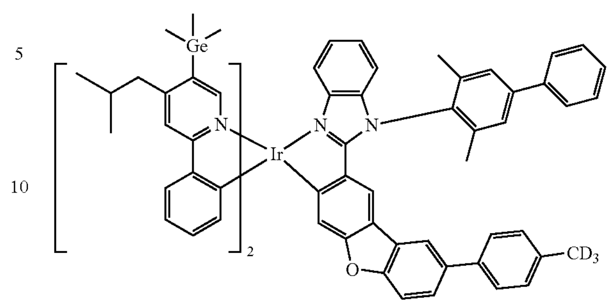
2806
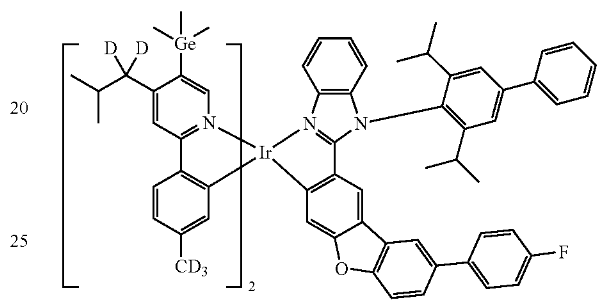
2807
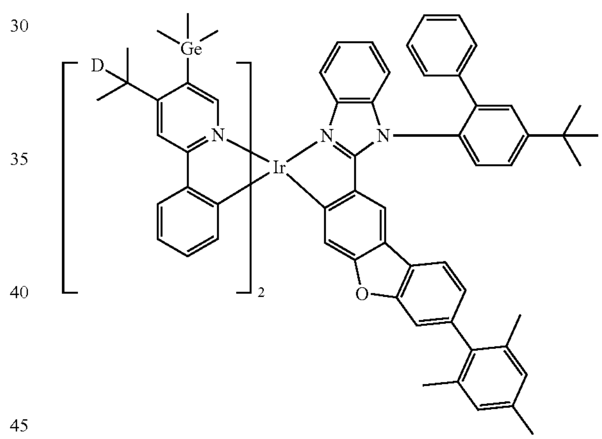
2808
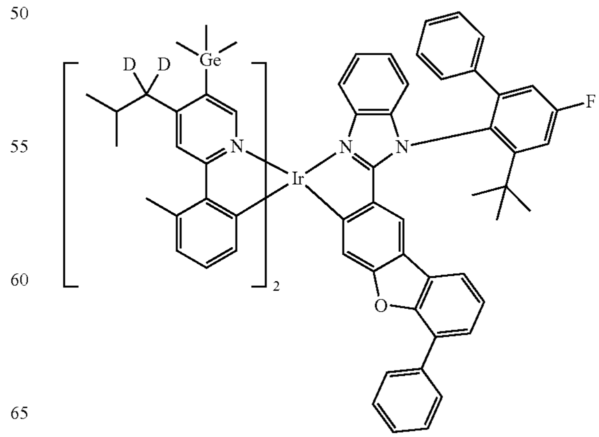

-continued
2809
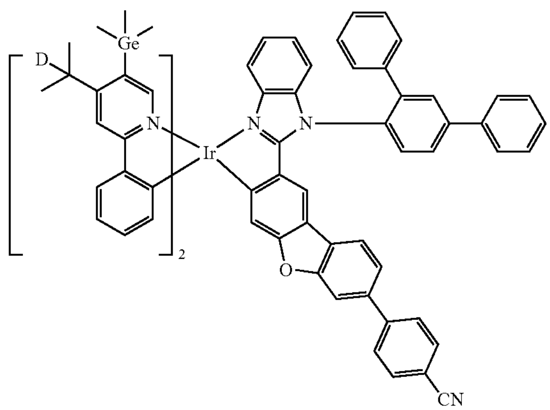
2810
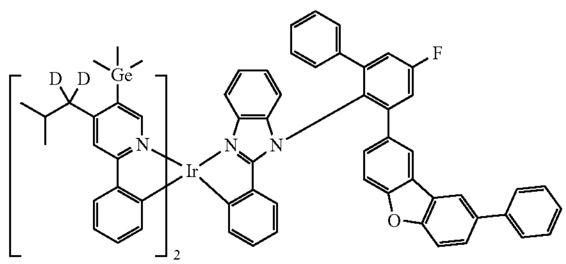
2811
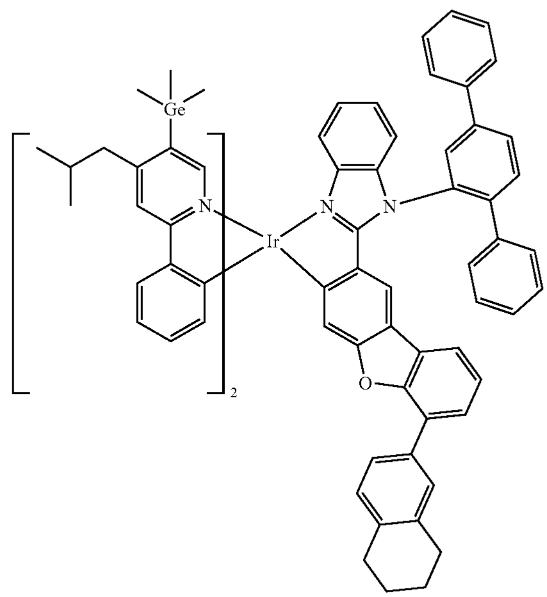
-continued
2812
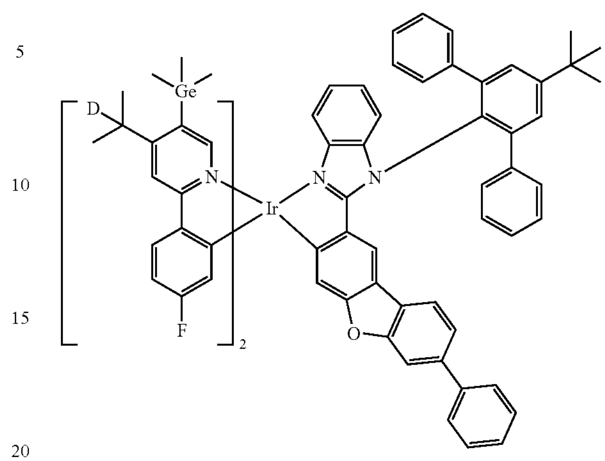
2814
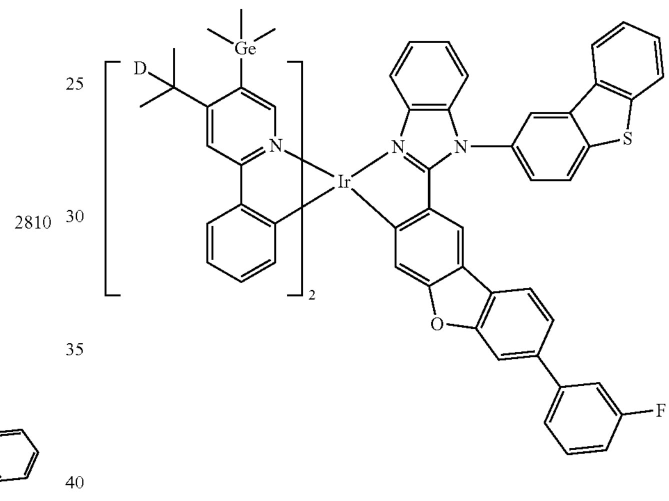
2815
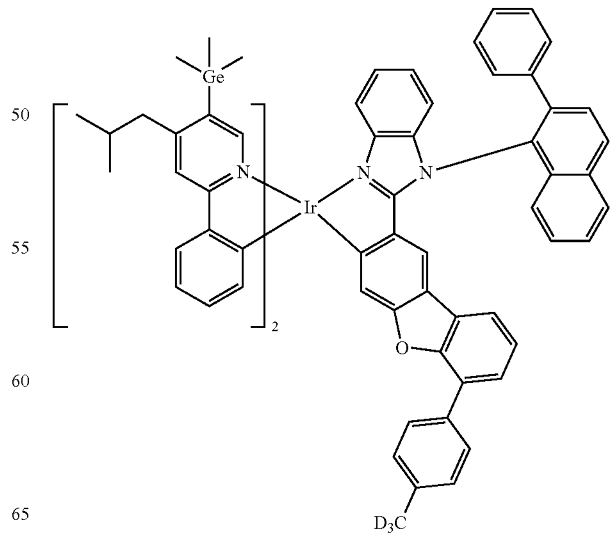

2816
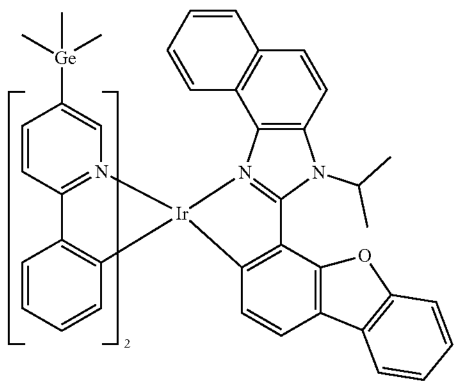
2817
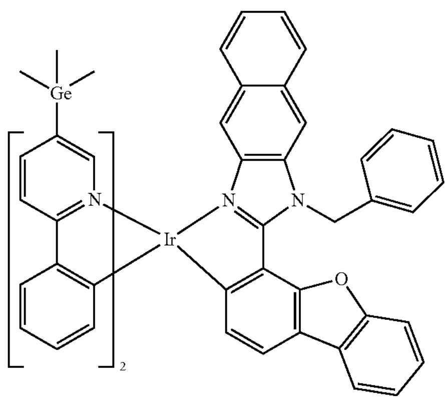
2818
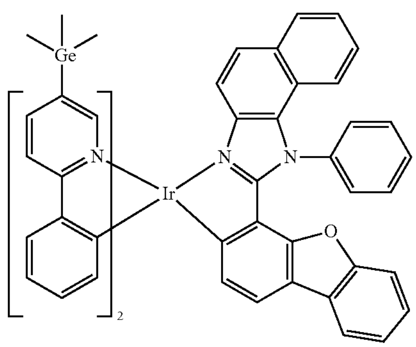
2819
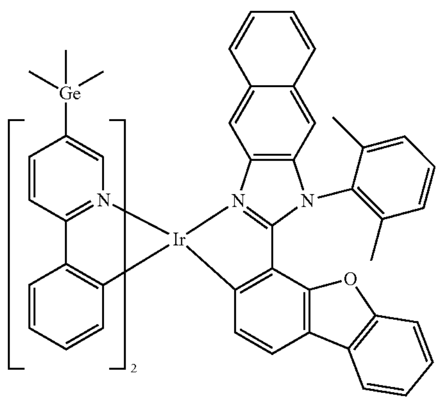
2820
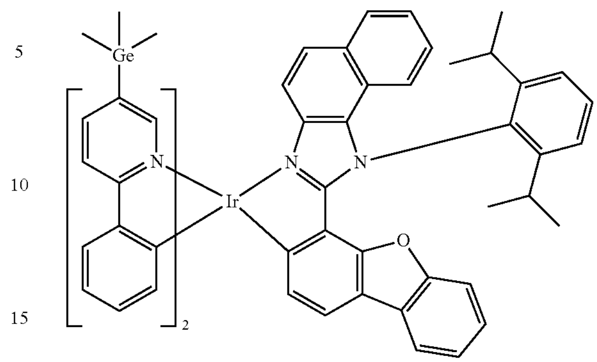
2821
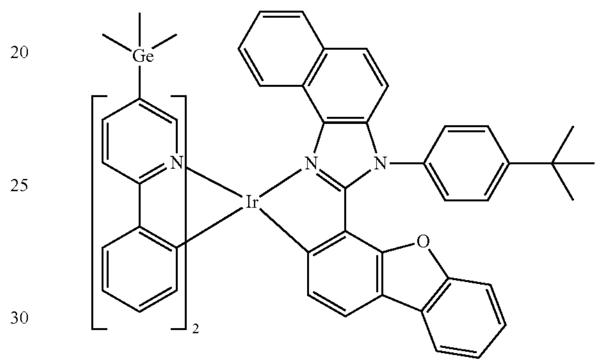
2822
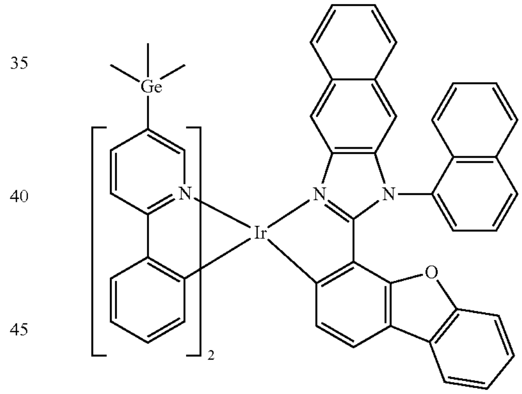
2823
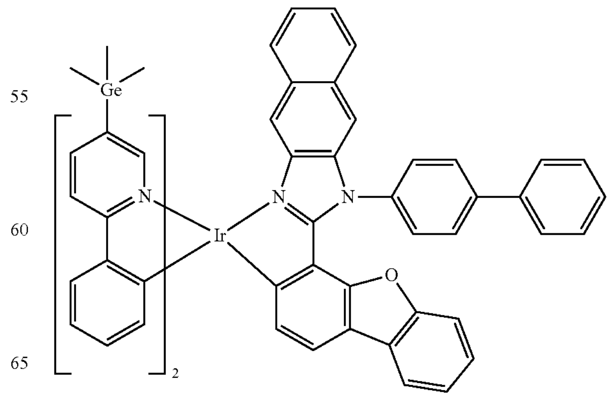

-continued
2824
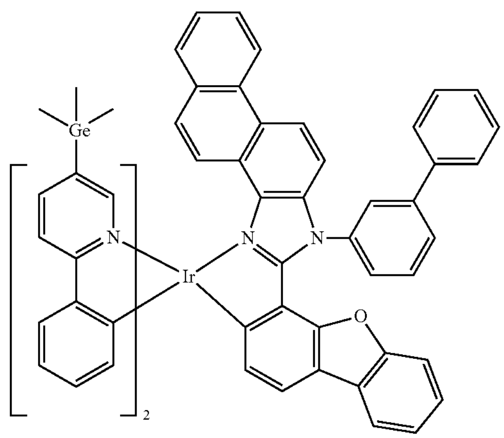
2825
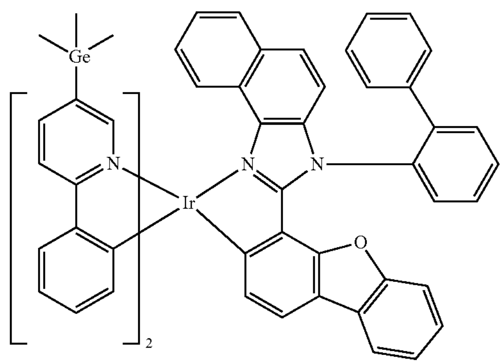
2826
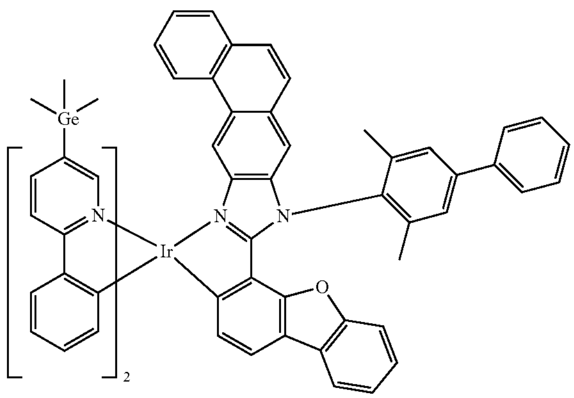
2827
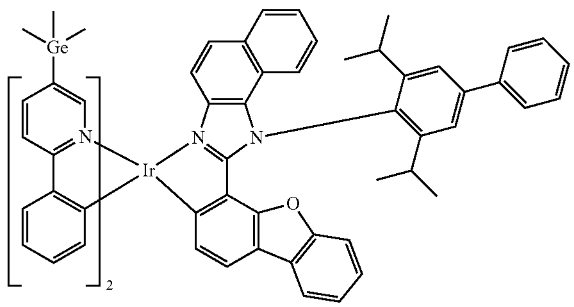
-continued
2828
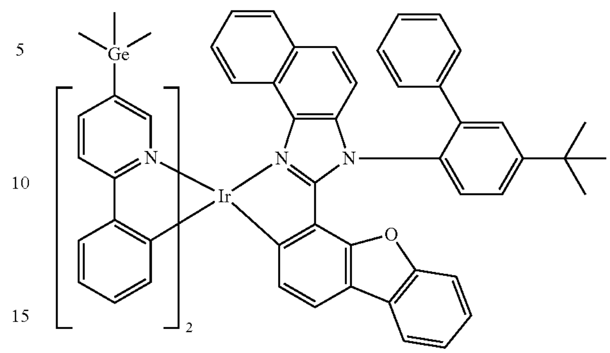
2829
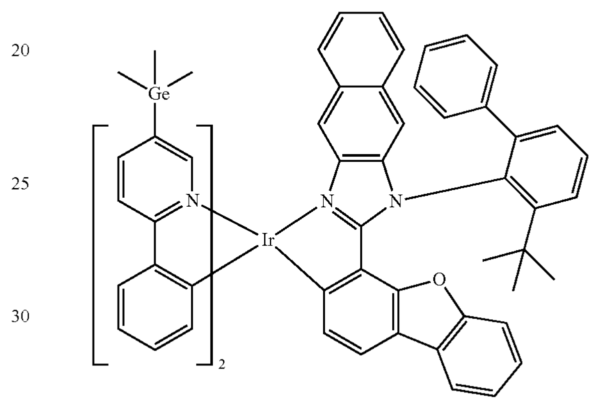
2830
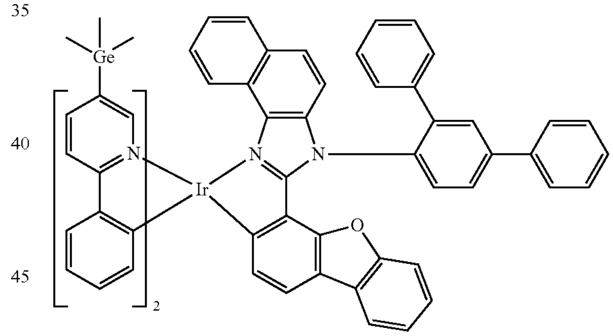
2831
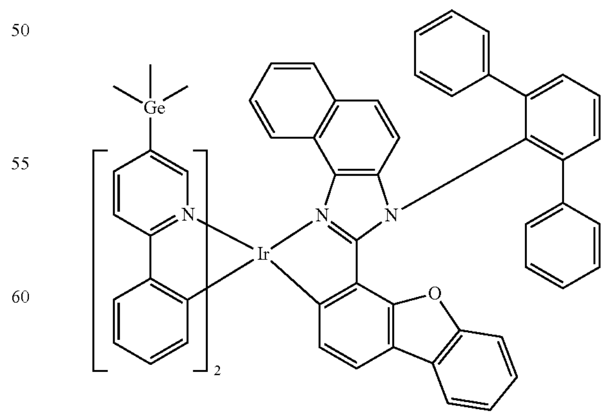

-continued
2832
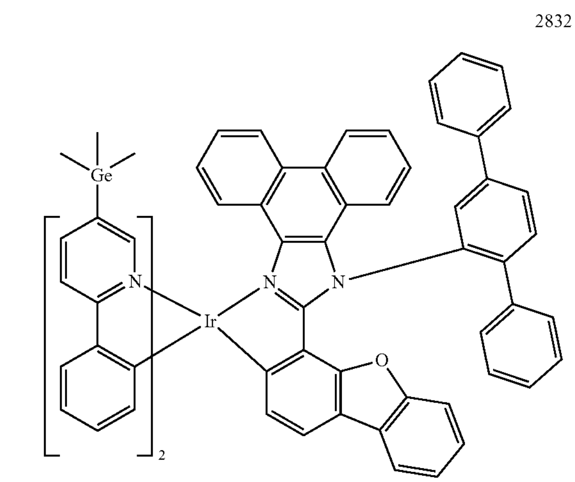
2833
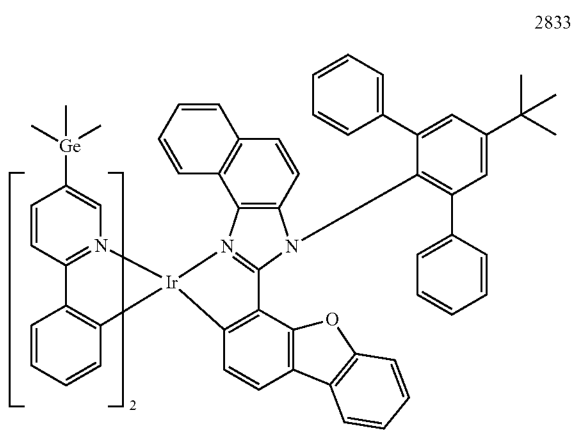
2834
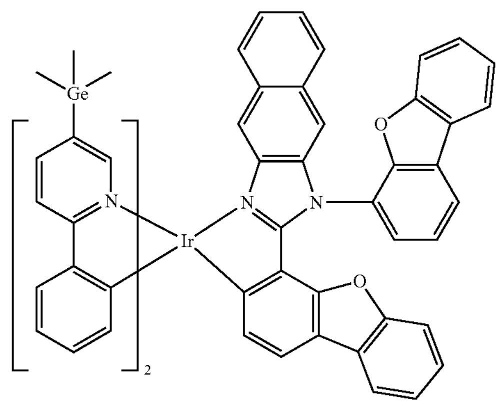
-continued
2835
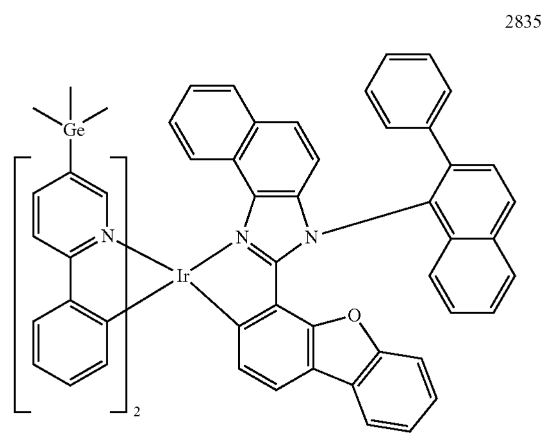
2836
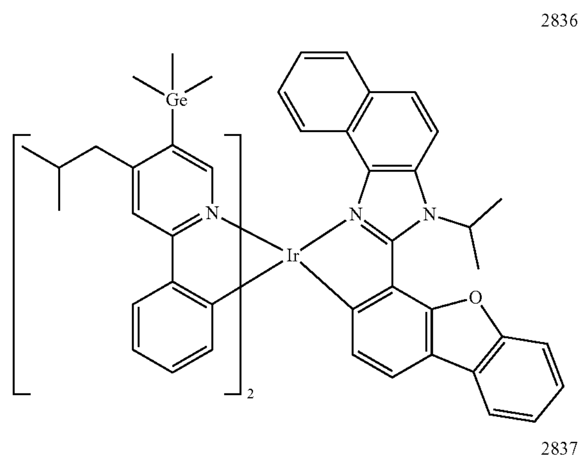
2837
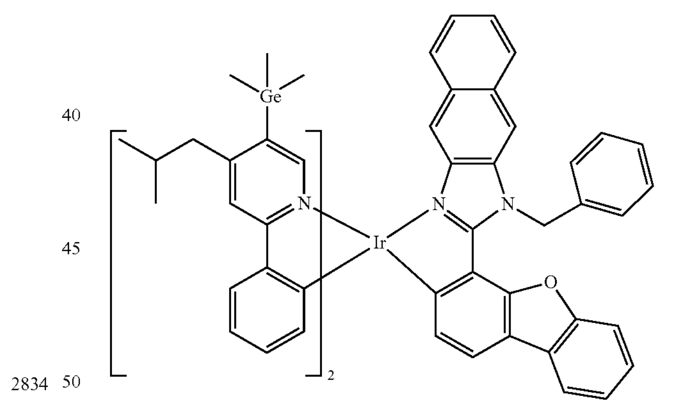
2838
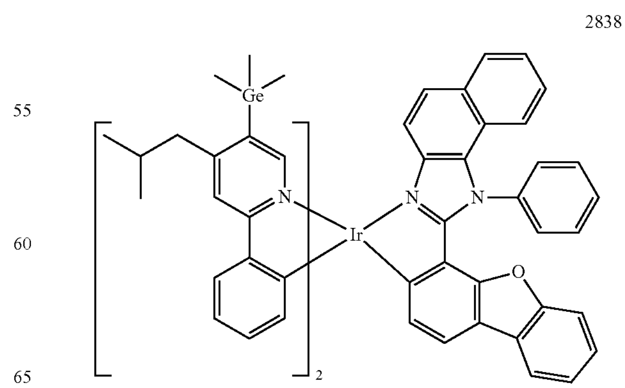

-continued
2839
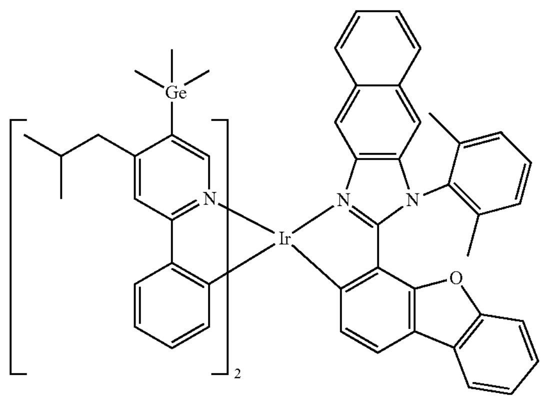
2840
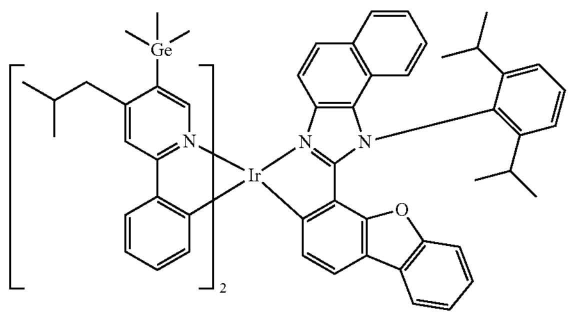
2841
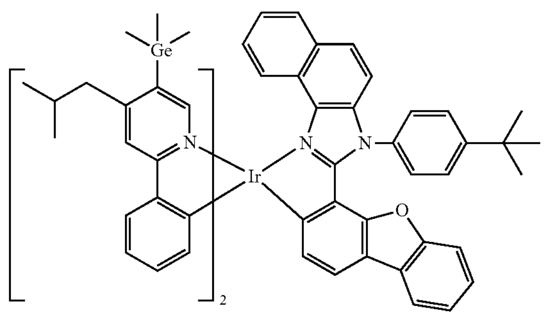
2842
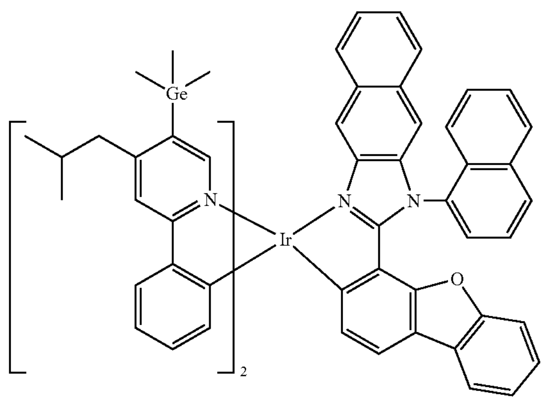
-continued
2843
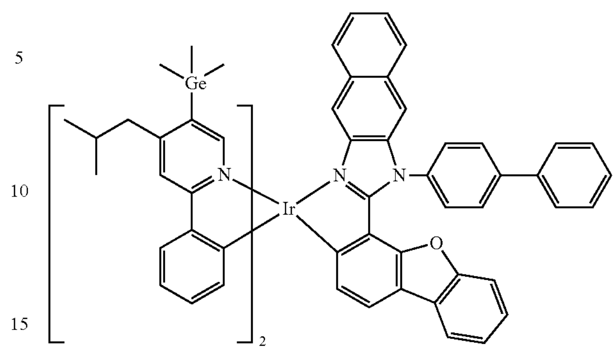
2844
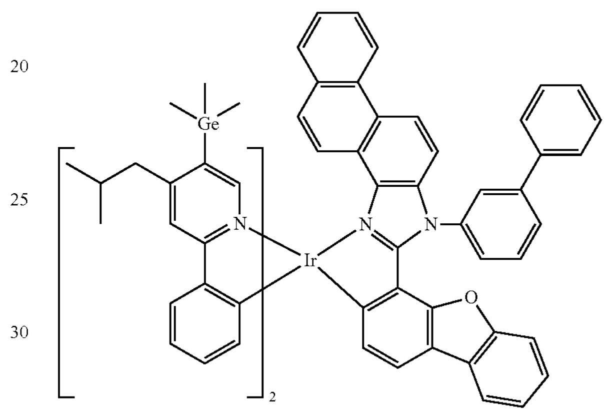
2845
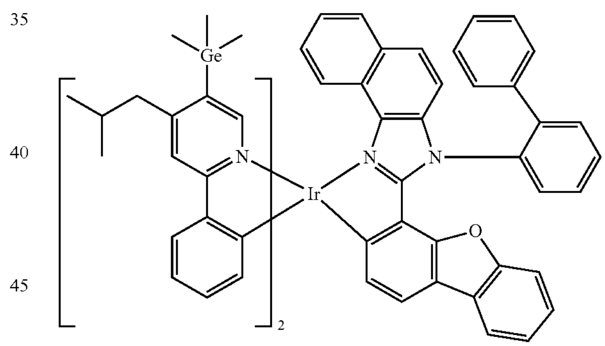
2846
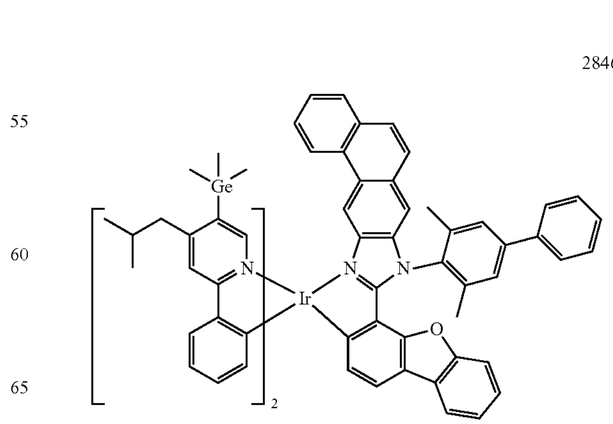

-continued
2847
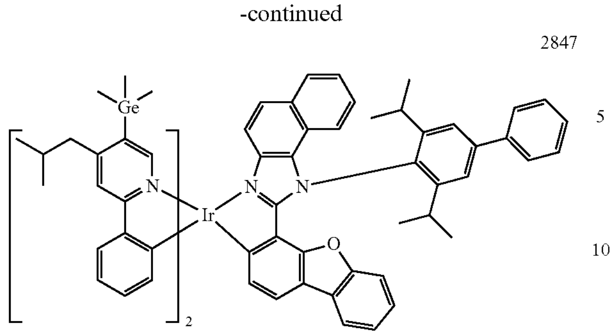
2848
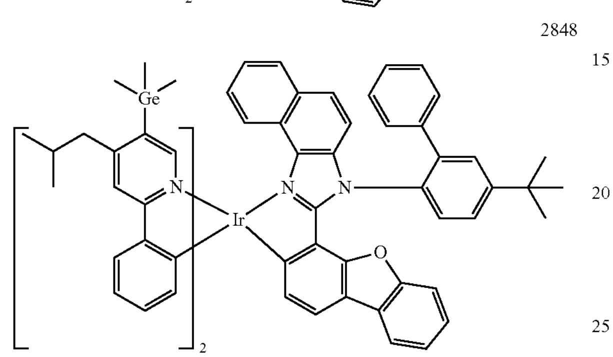
2849
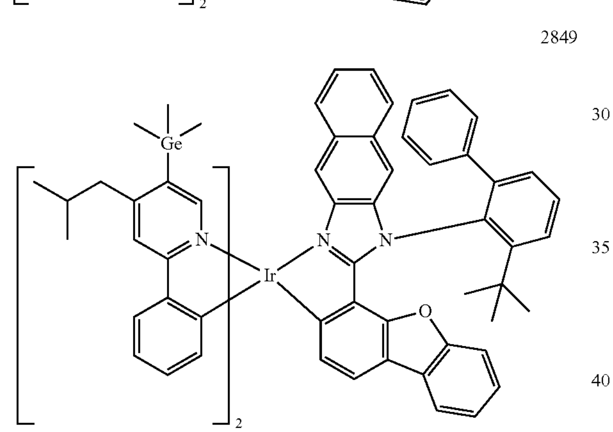
2850
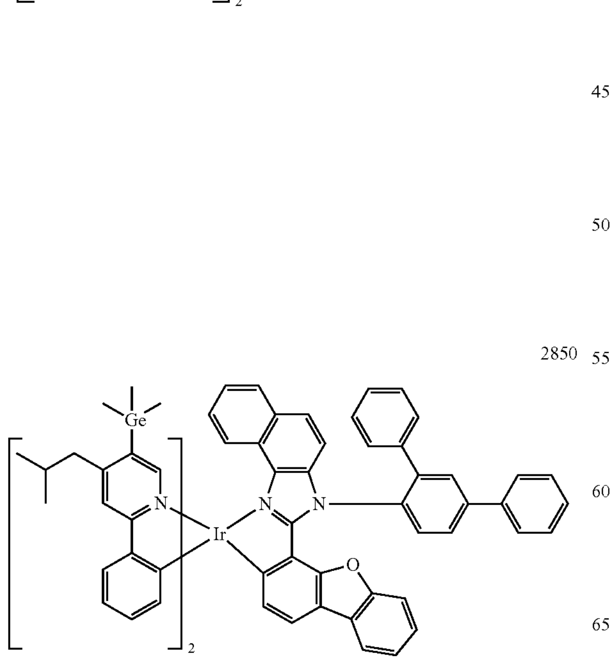
-continued
2851
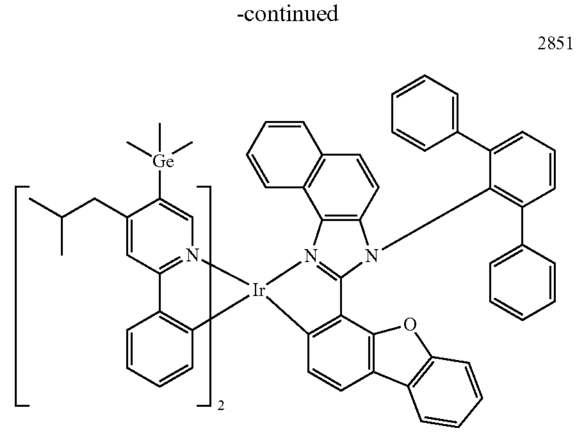
2852
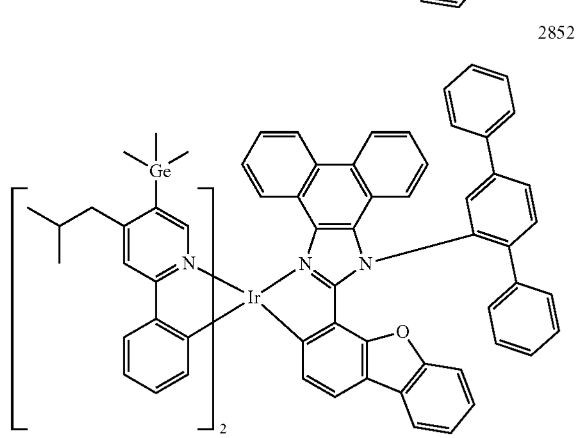
2853
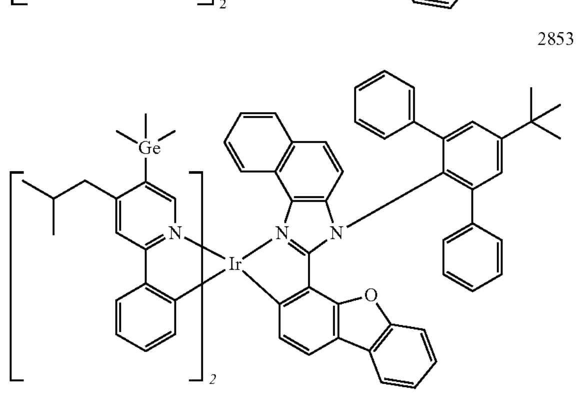
2854
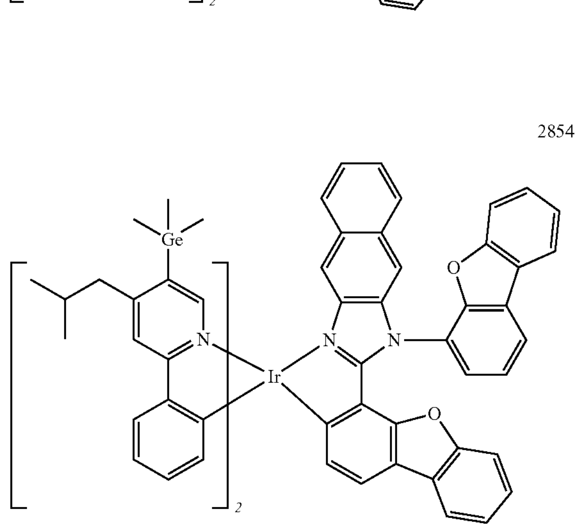

-continued
2855
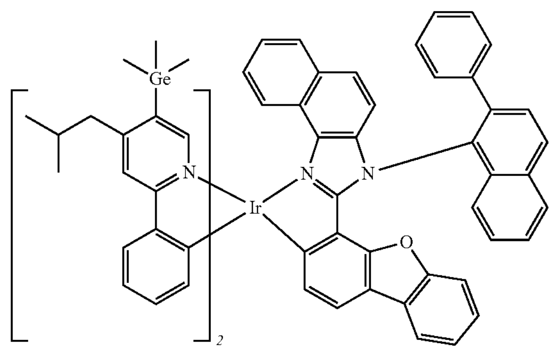
2856
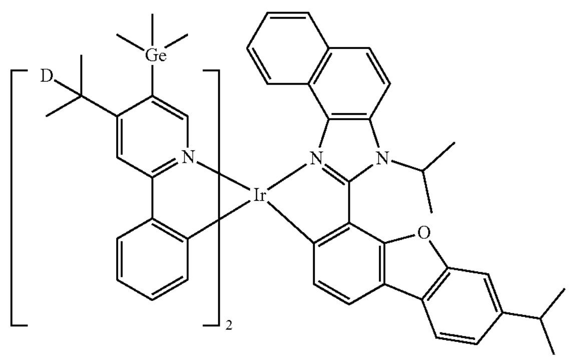
2857
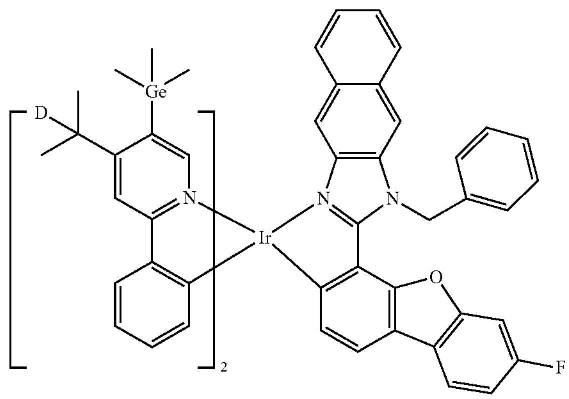
2858
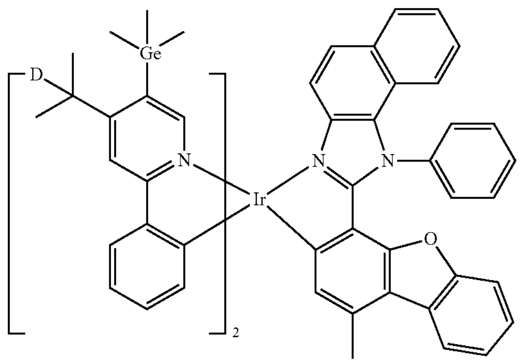
-continued
2859
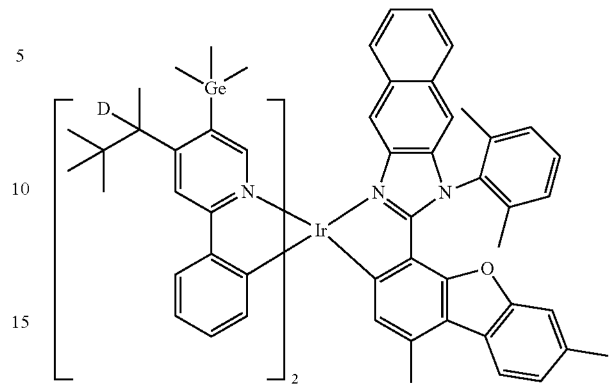
2860
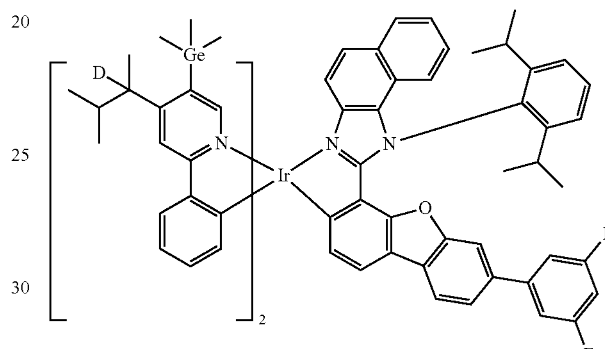
2861
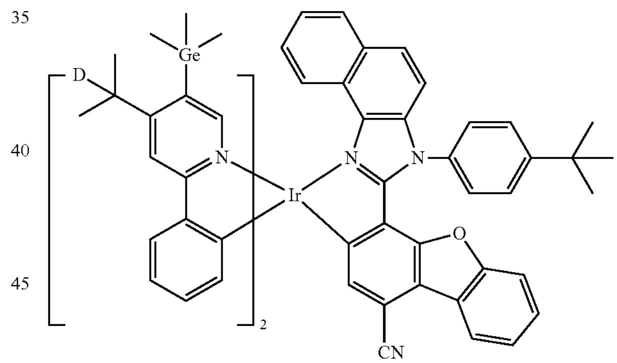
2862
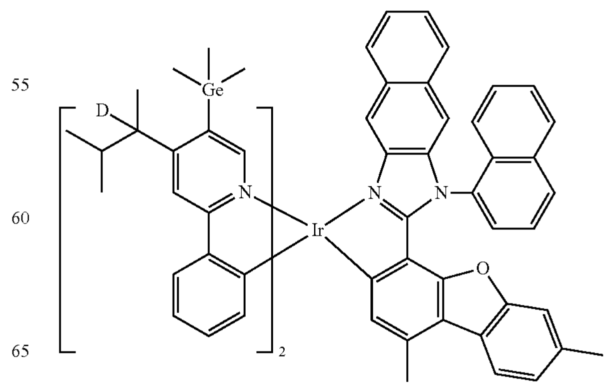

-continued
2863
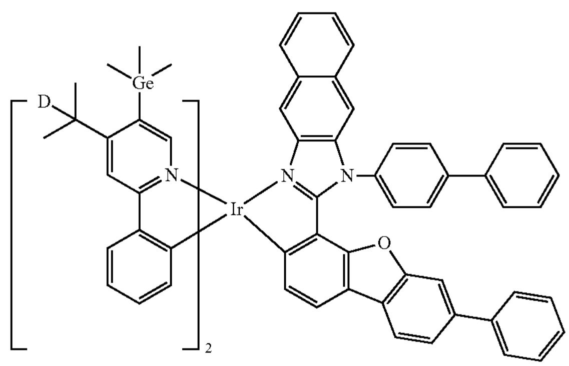
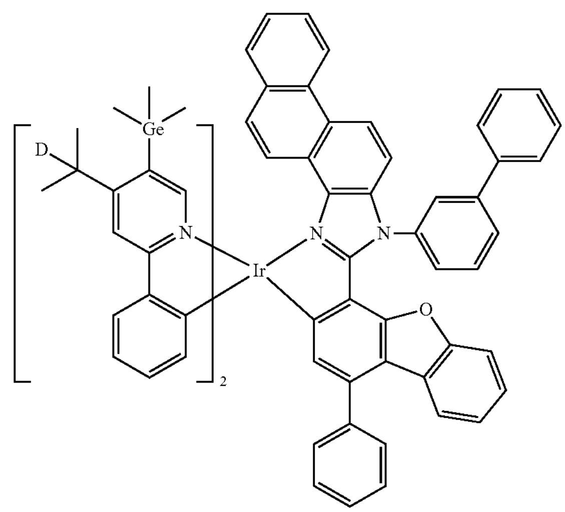
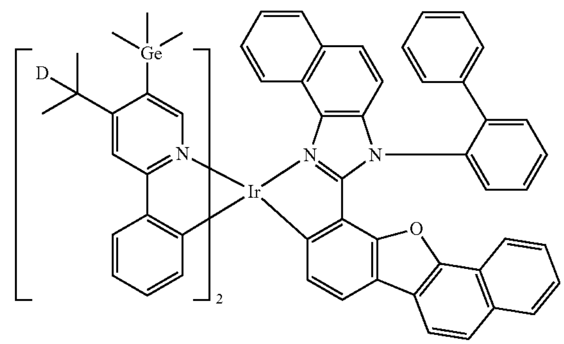
2866
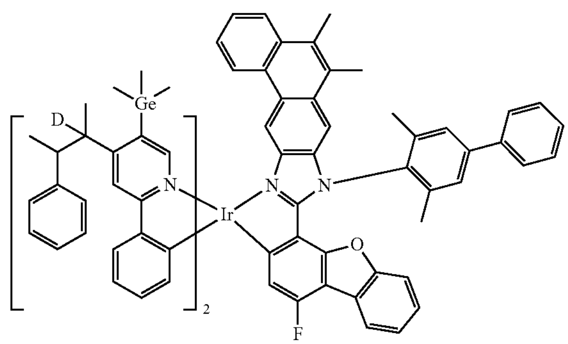
-continued
2867
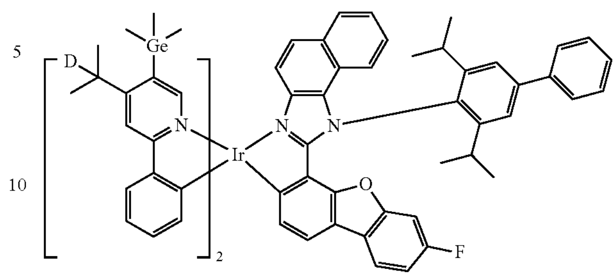
2868
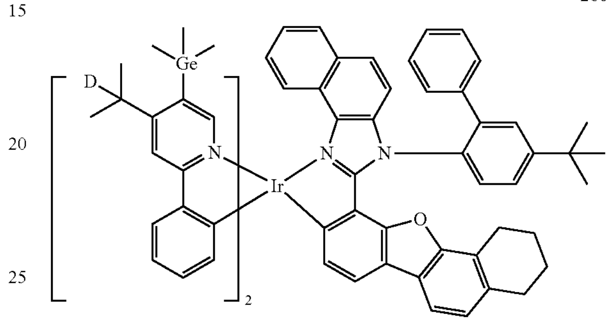
2869
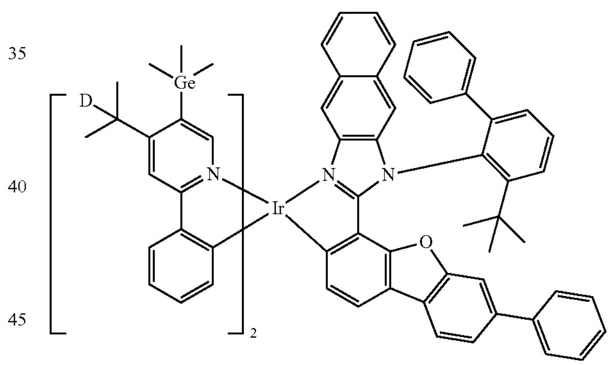
2870
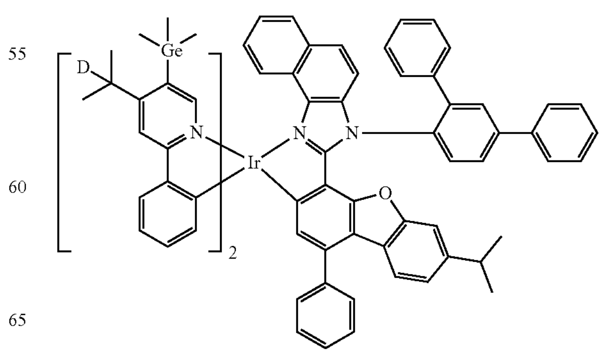

-continued
2871
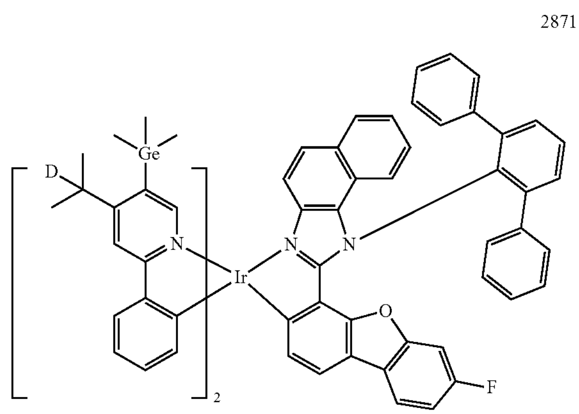
2872
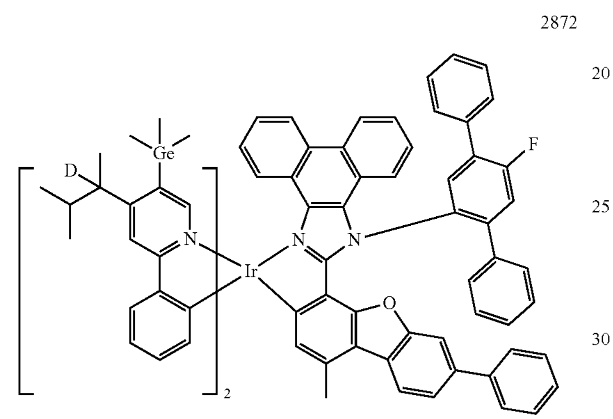
2873
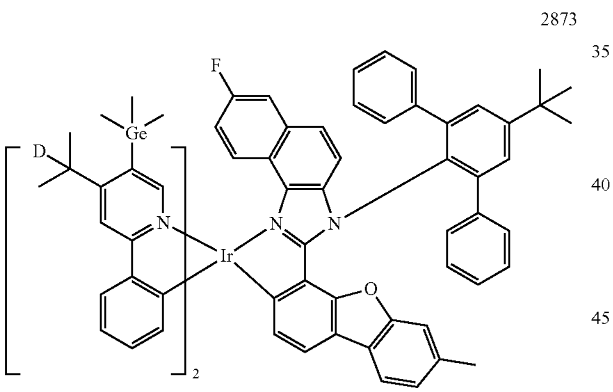
2876
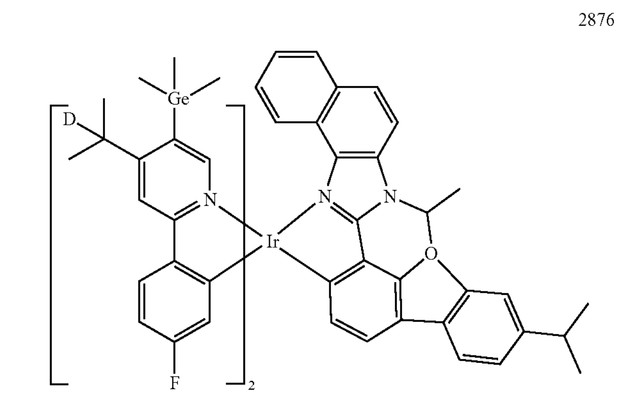
-continued
2874
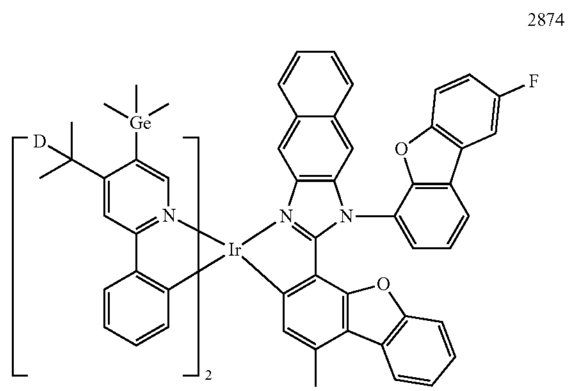
2875
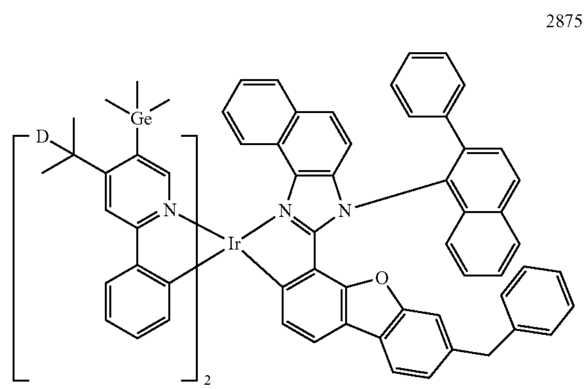
2877
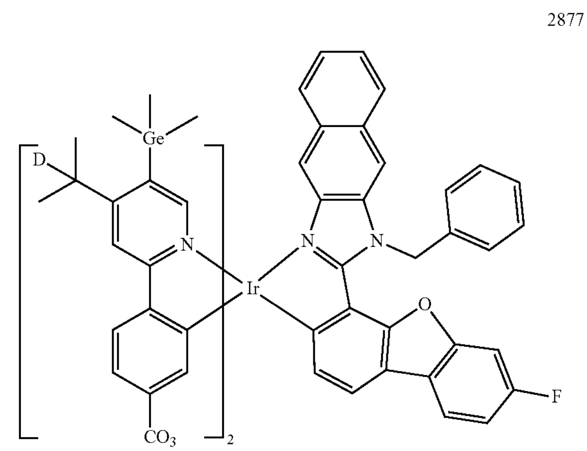

-continued
2878
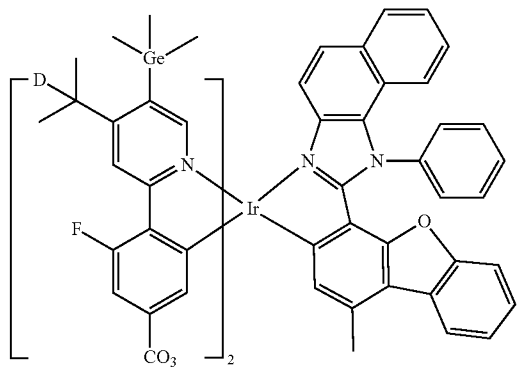
2879
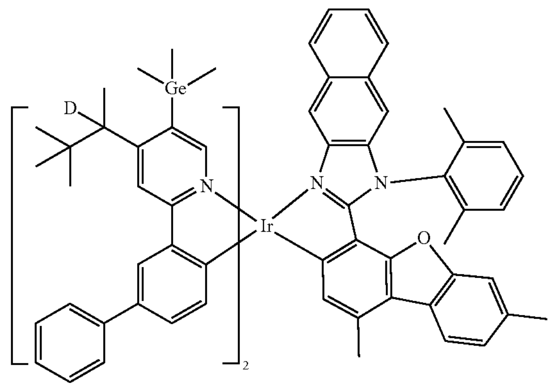
2880
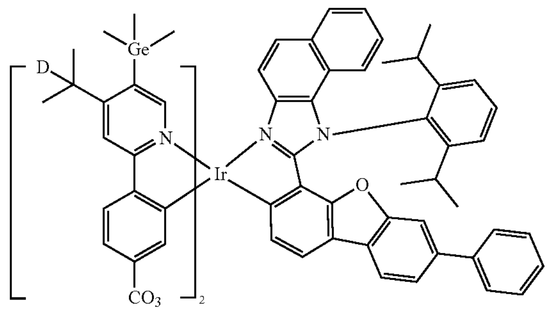
2881
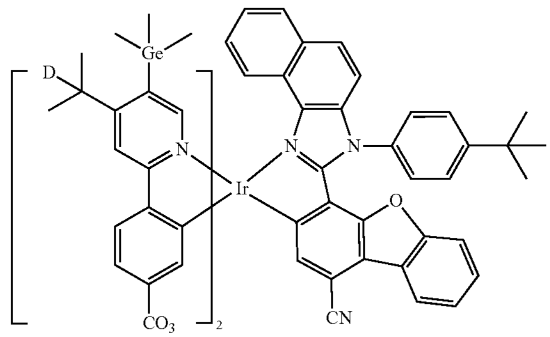
2882
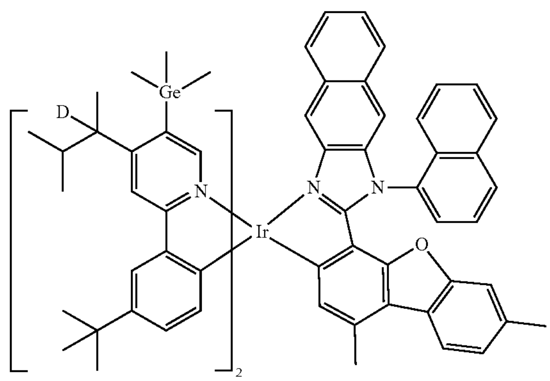
2883
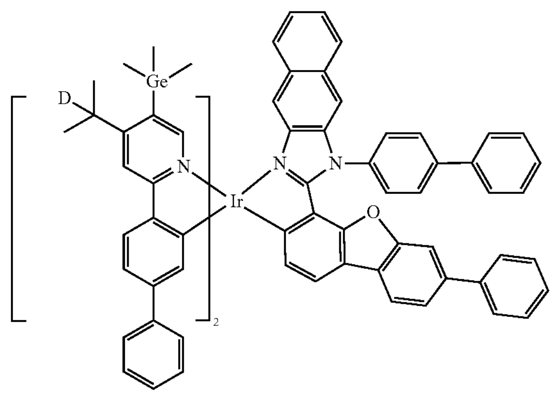

-continued
2884
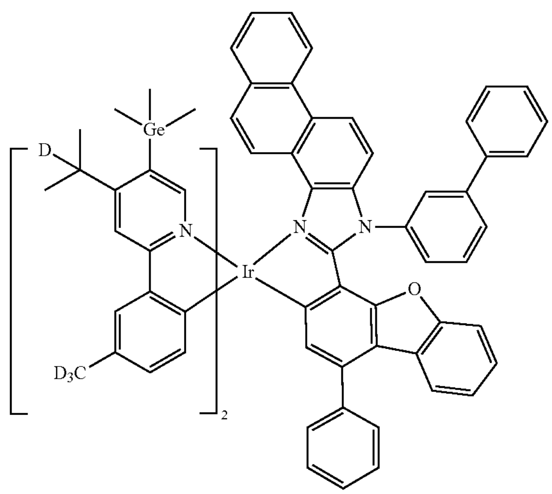
2885
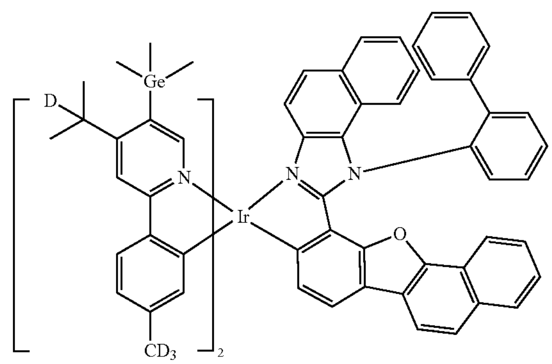
2886
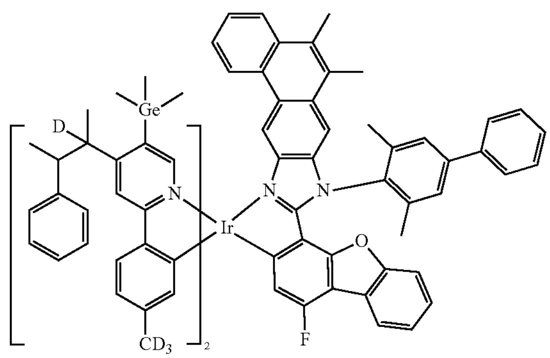
2887
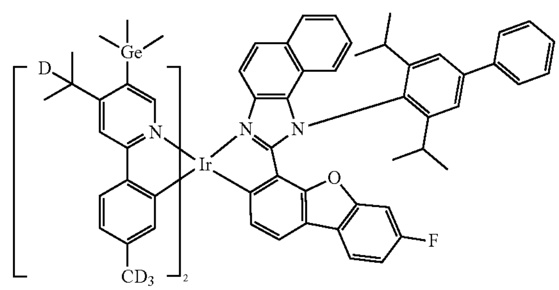
2888
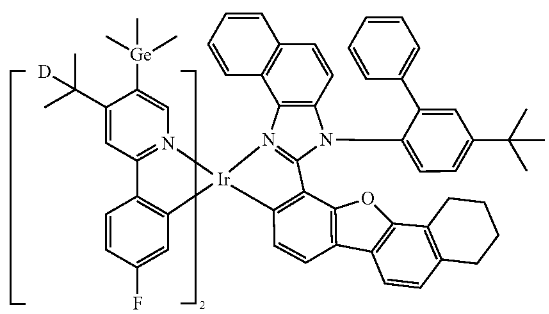
2889
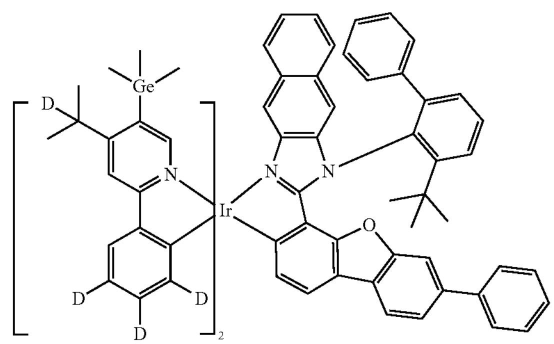
2890
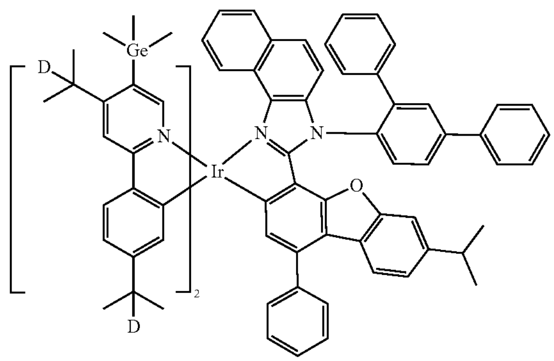
2891
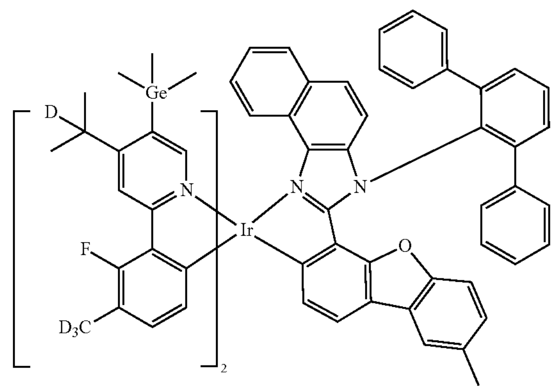

-continued
2892
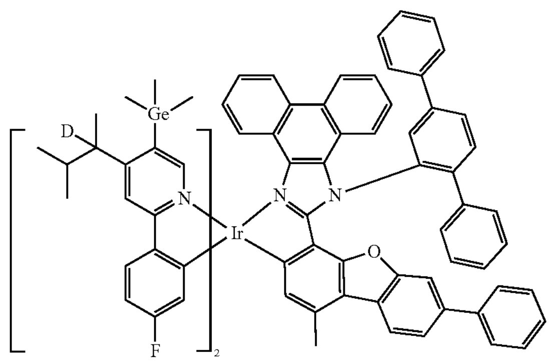
2893
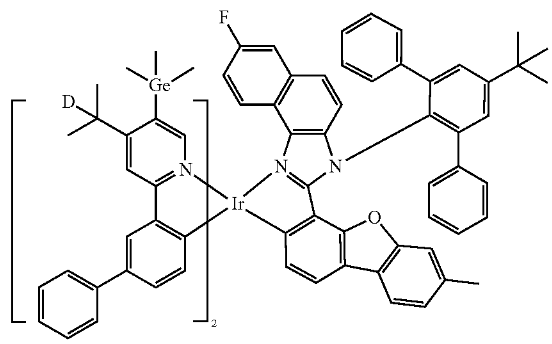
2894
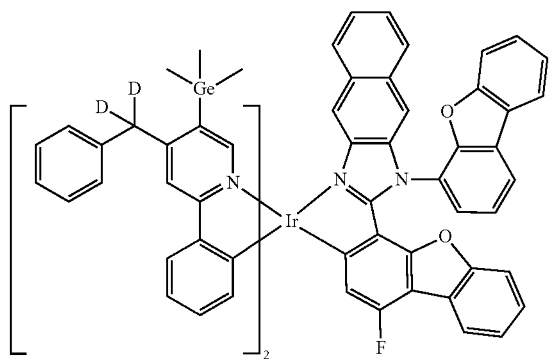
2895
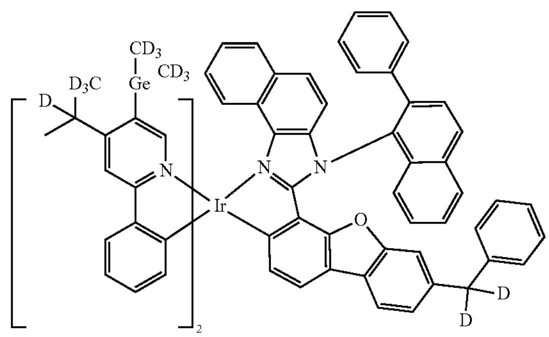
2896
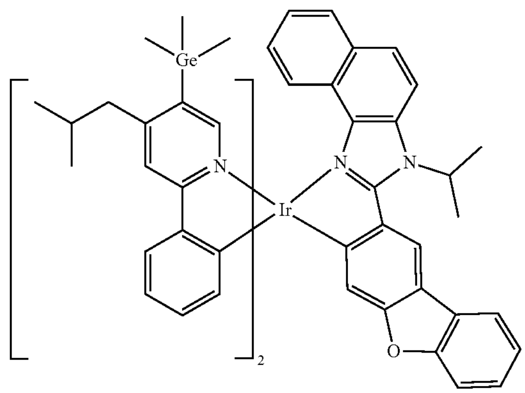
2897
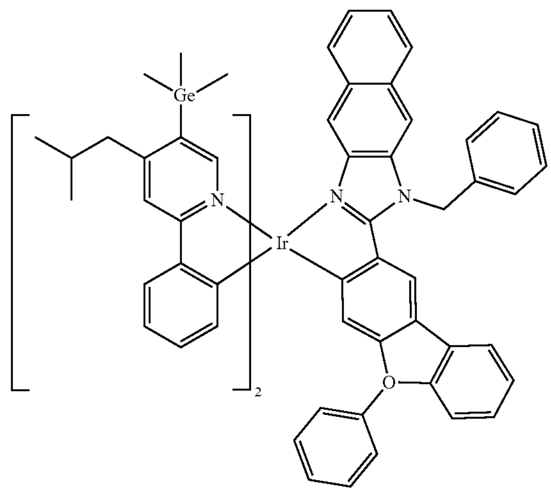

-continued
2898
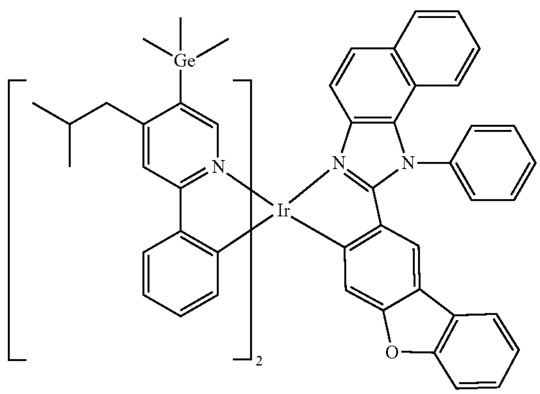
2899
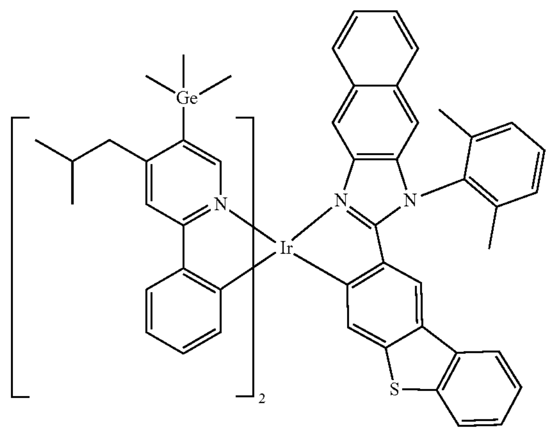
2900
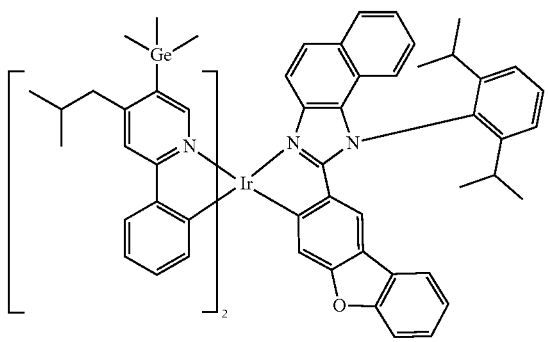
2901
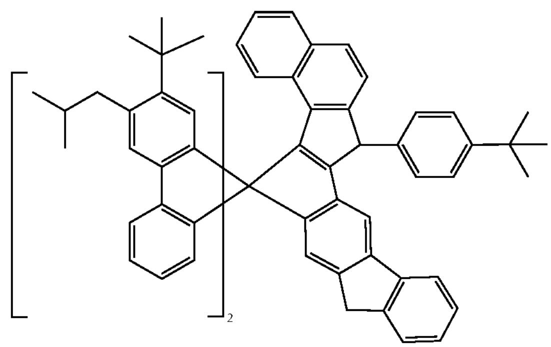
2902
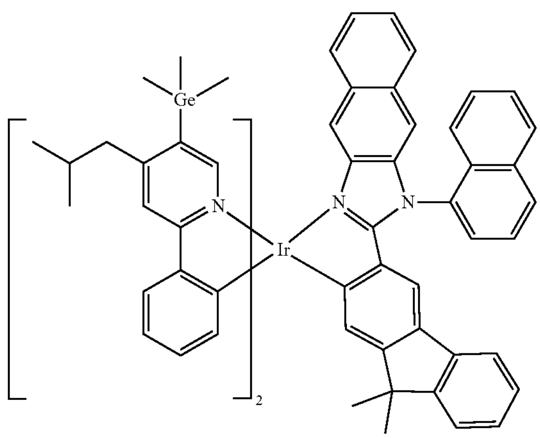
2903
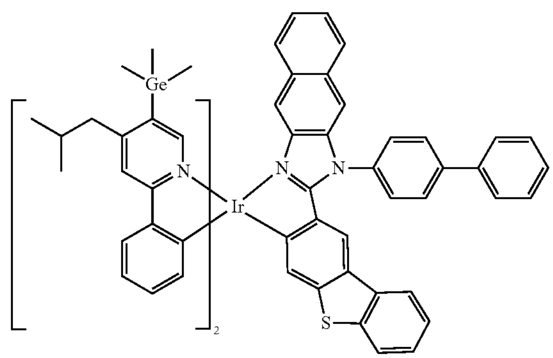

-continued
2904
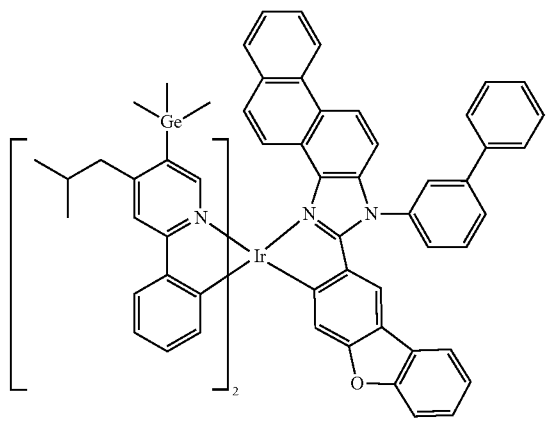
2905
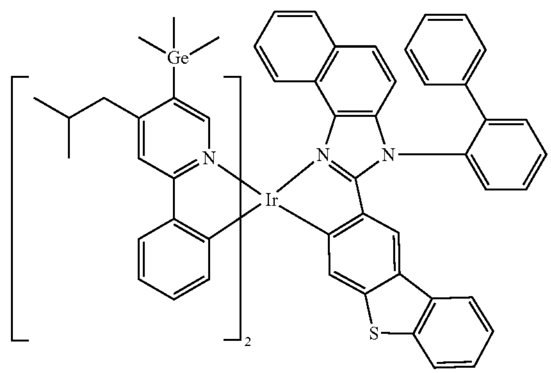
2906
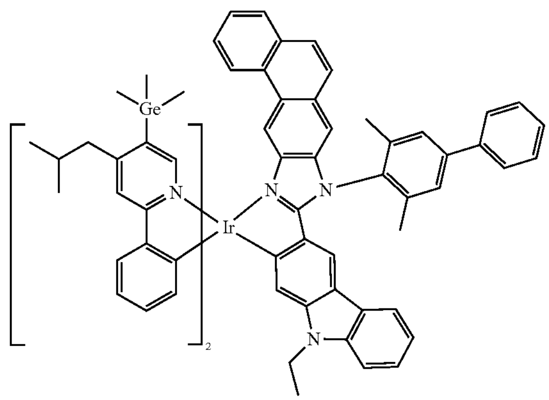
2907
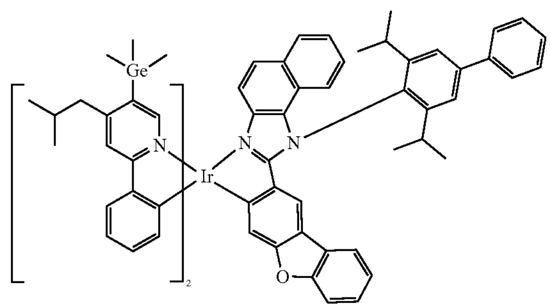
2908
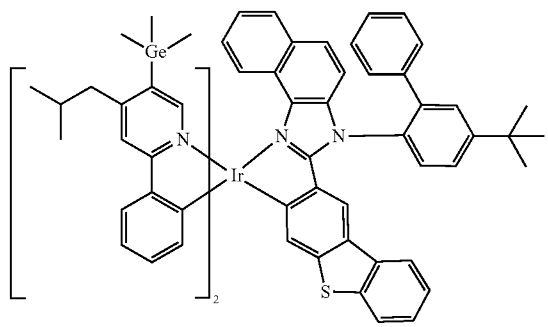
2909
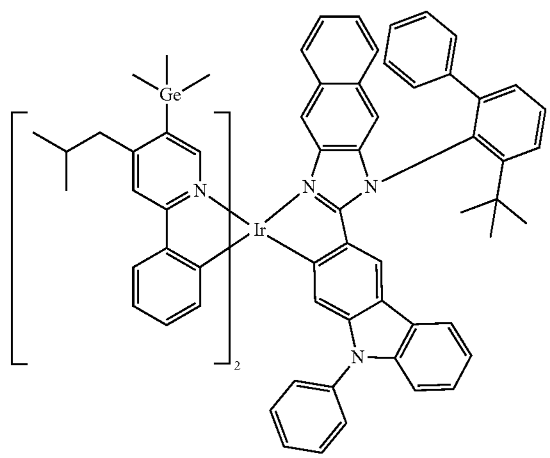

-continued
2910
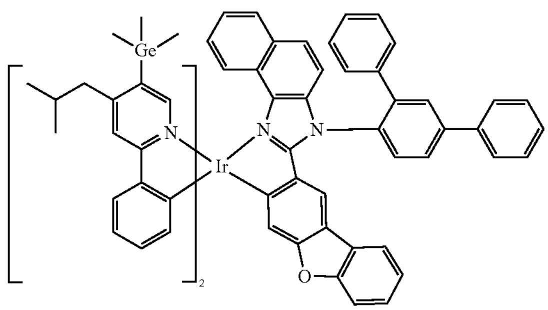
2911
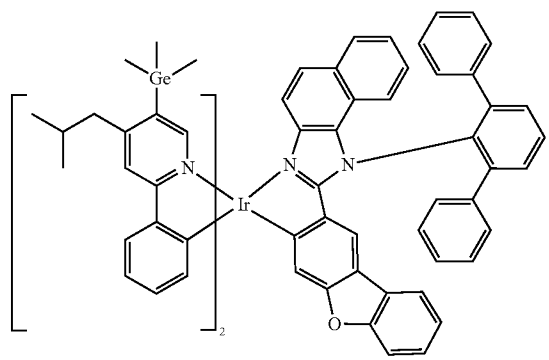
2912
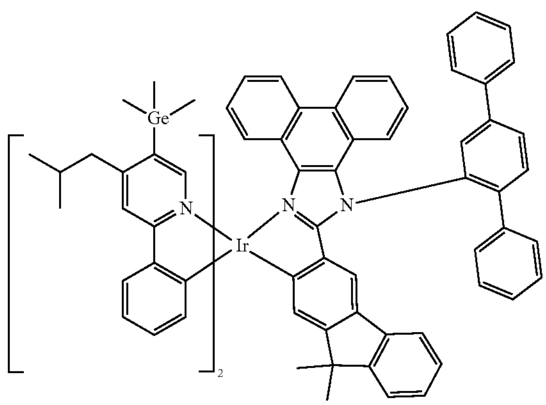
2913
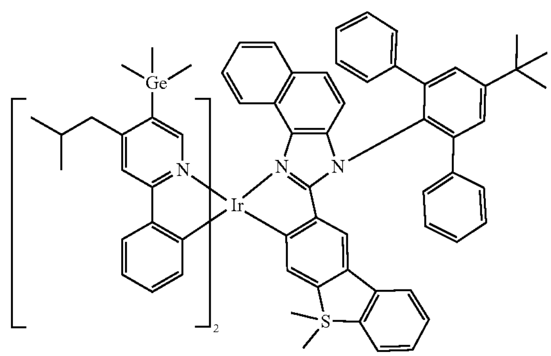
2914
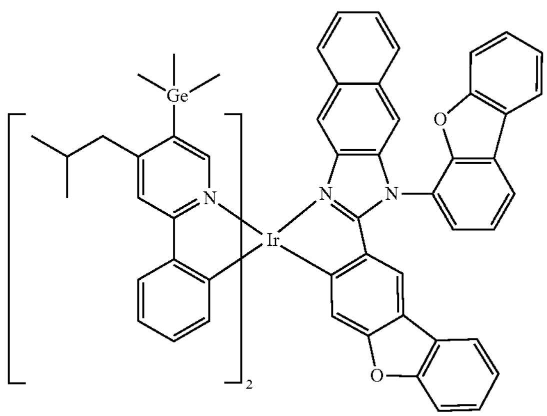
2915
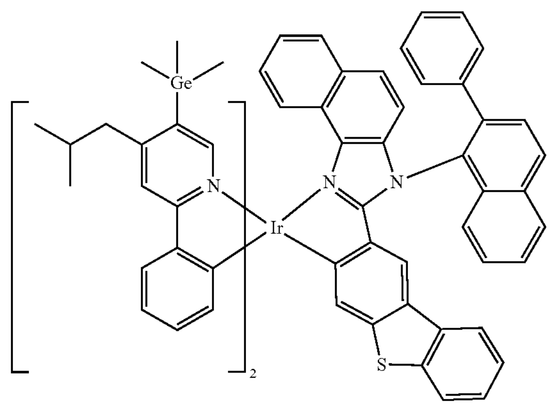

-continued
2916
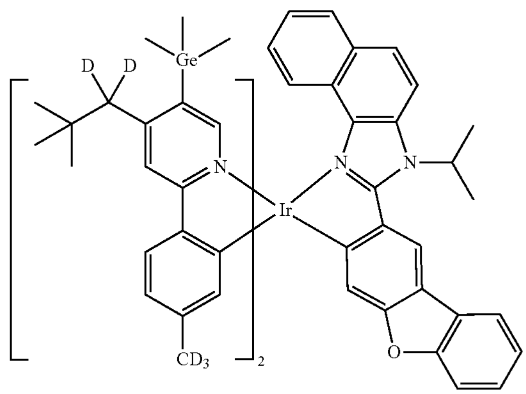
2917
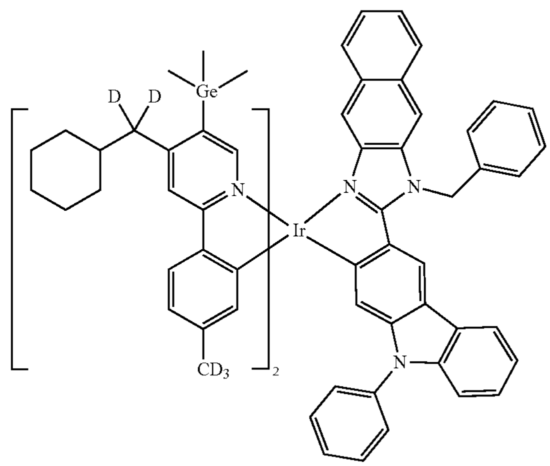
2918
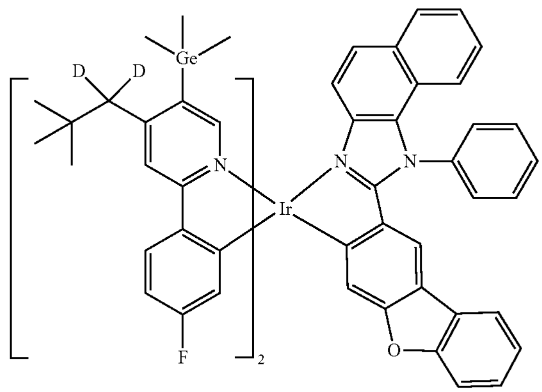
2919
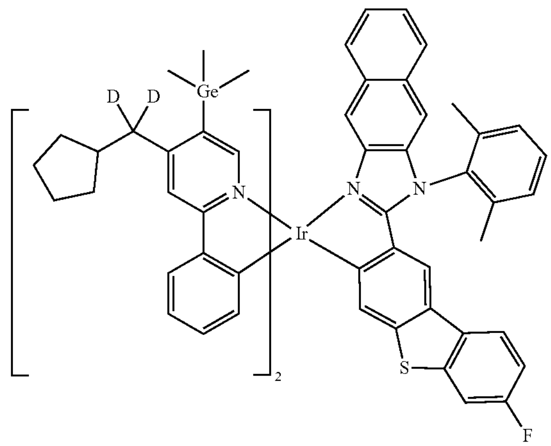
2920
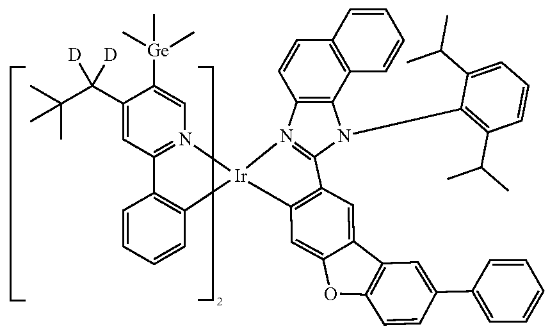
2921
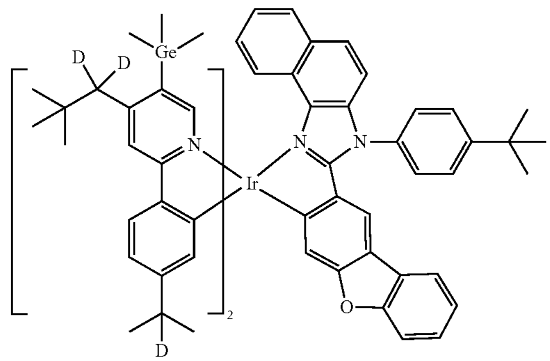

-continued
2922
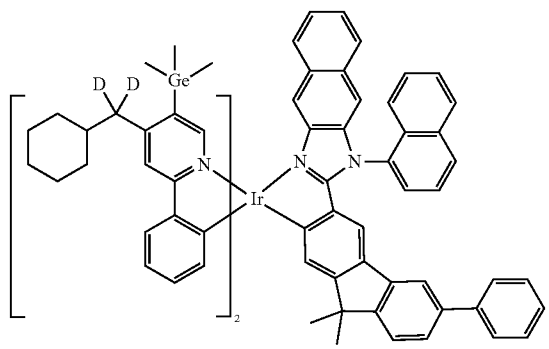
2923
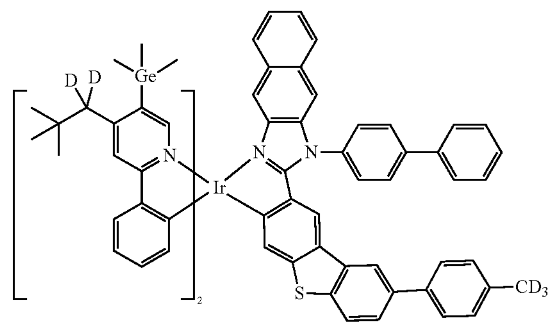
2924
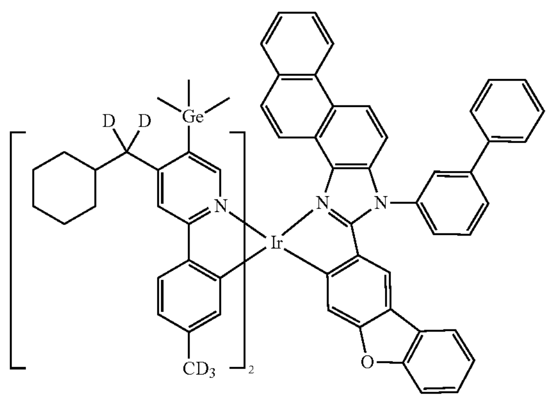
2925
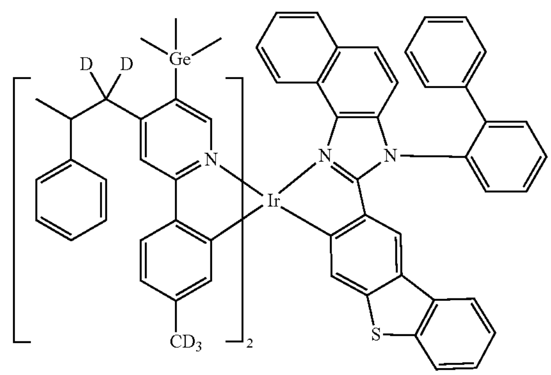
2926
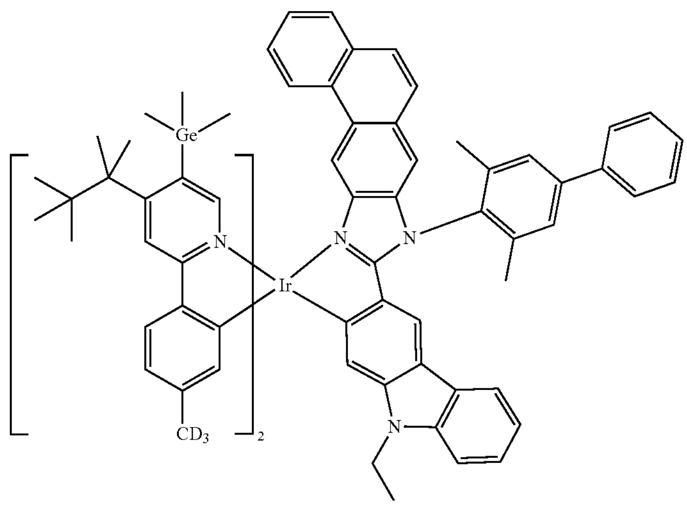

-continued
2927
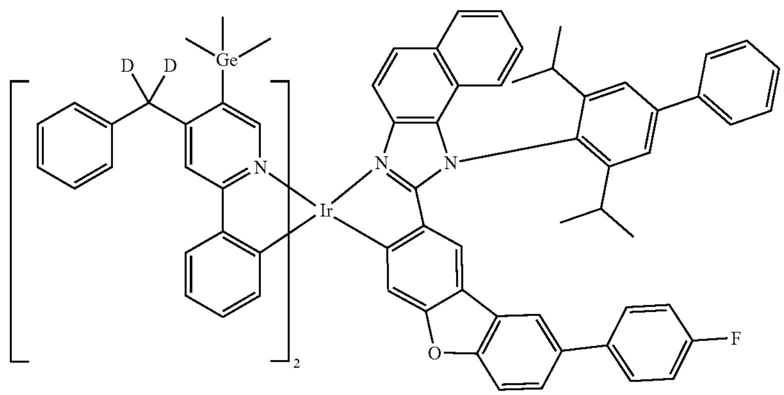
2928
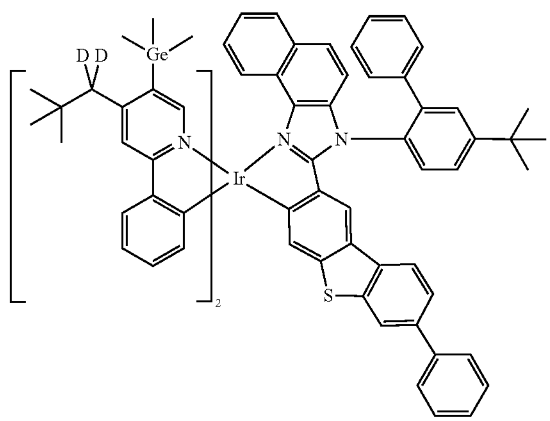
2929
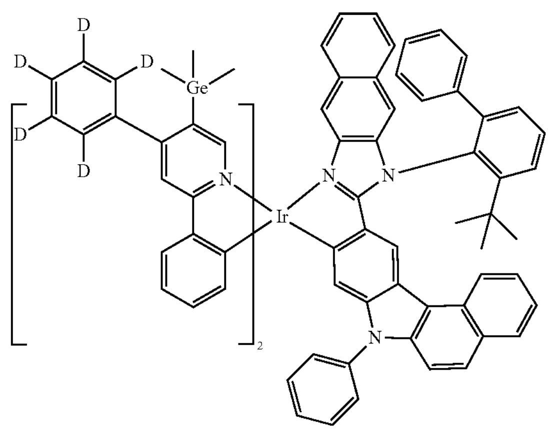
2930
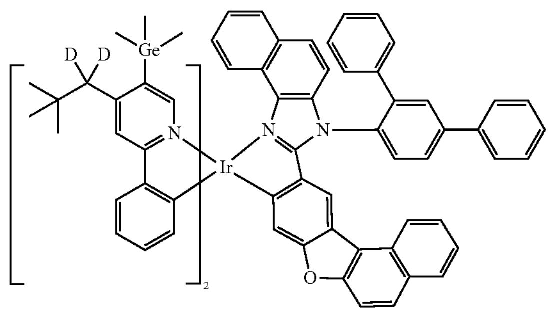
2931
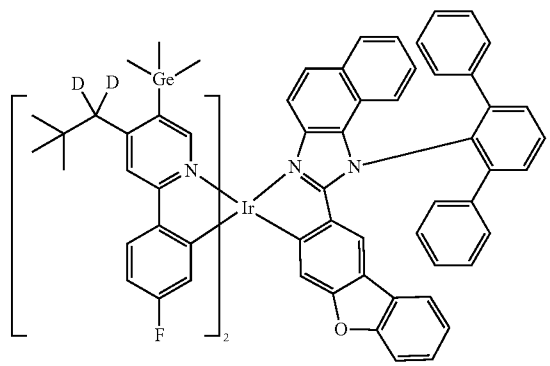
2932
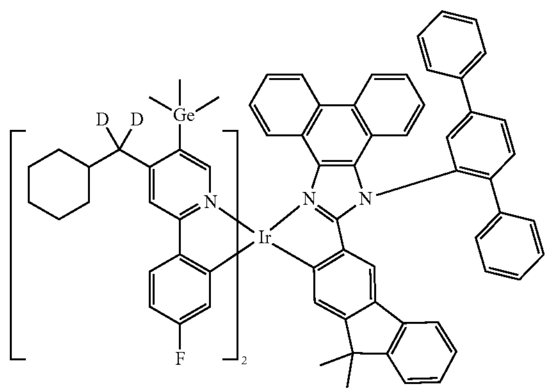
2933
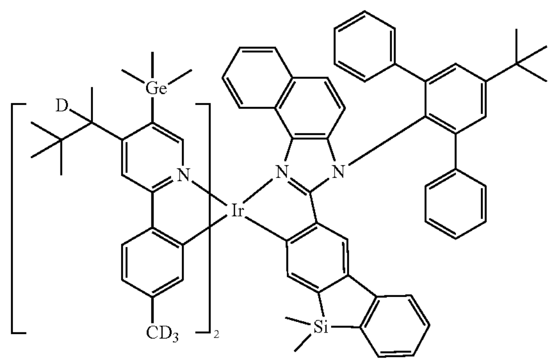

-continued
2934
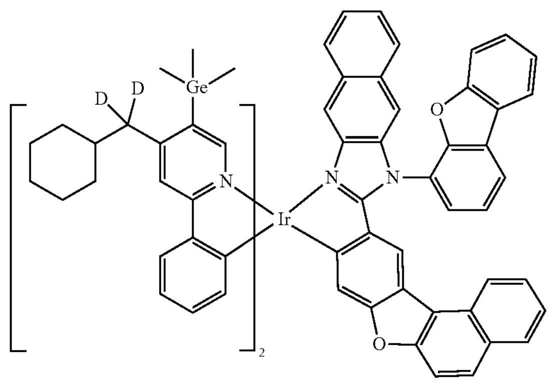
2935
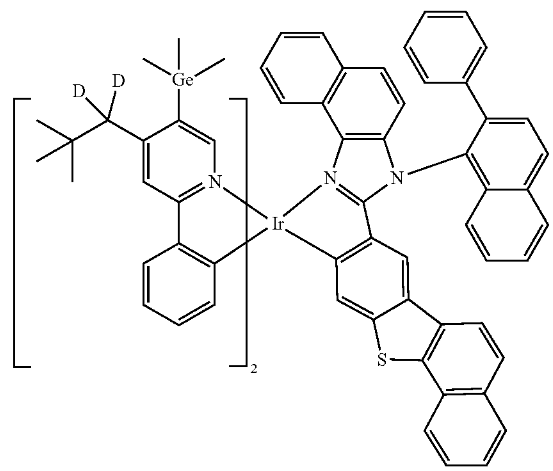
2936
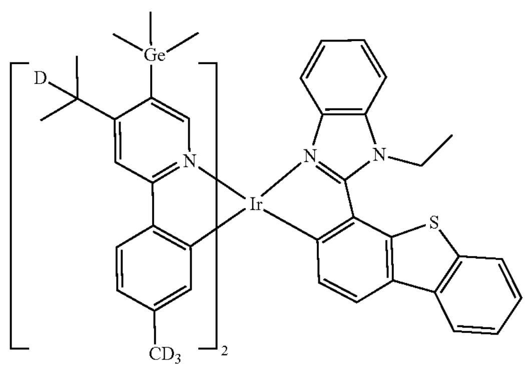
2937
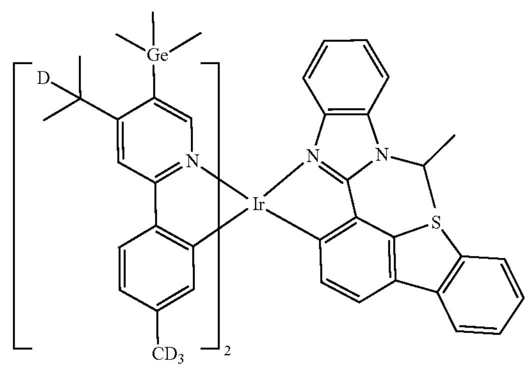
2938
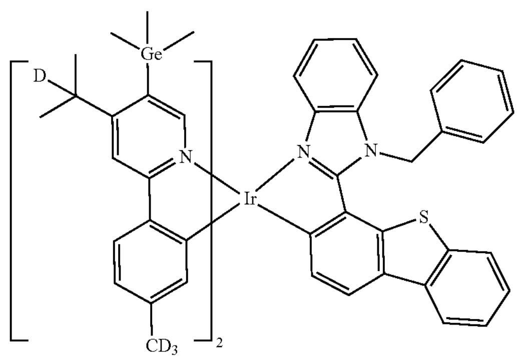
2939
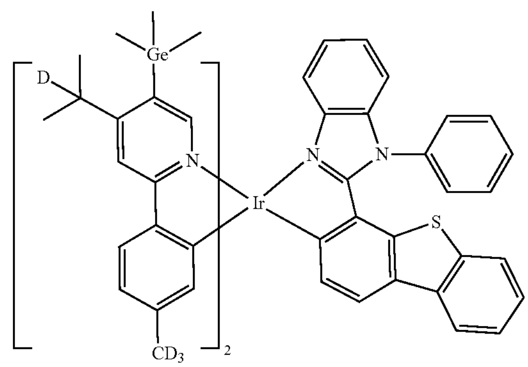
2940
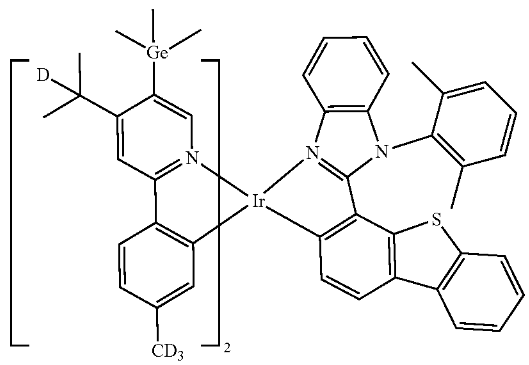
2941
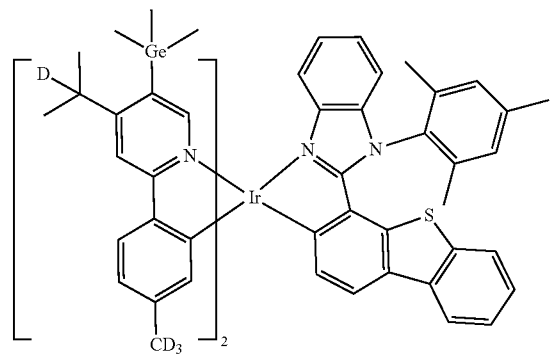

-continued
2942
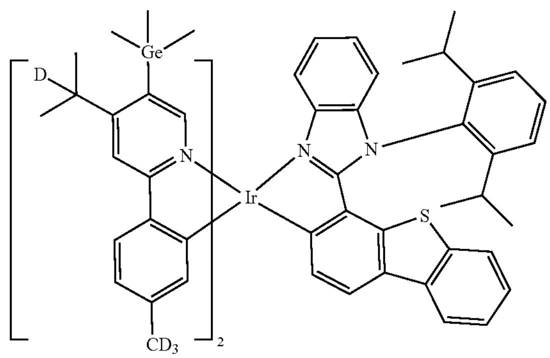
2943
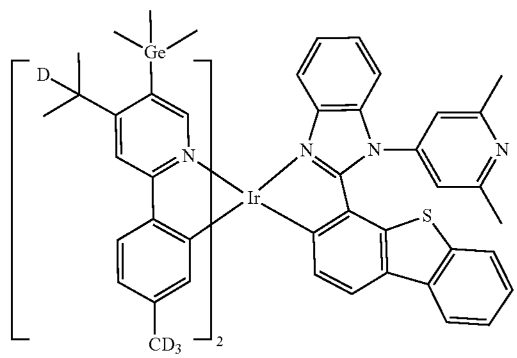
2944
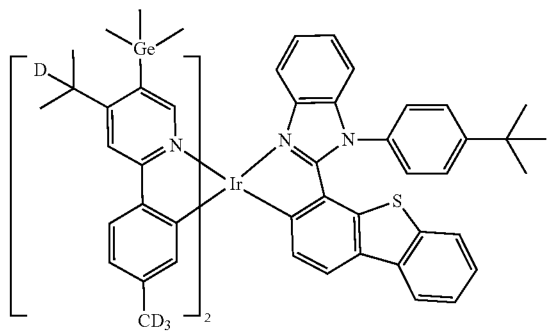
2945
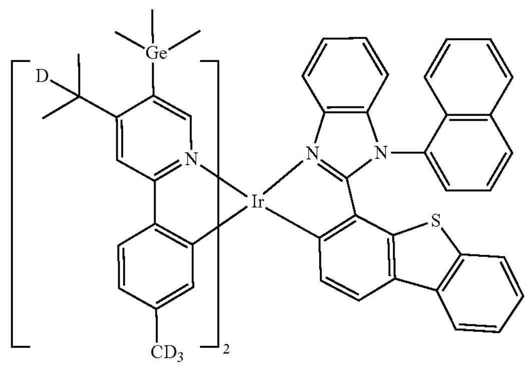
2946
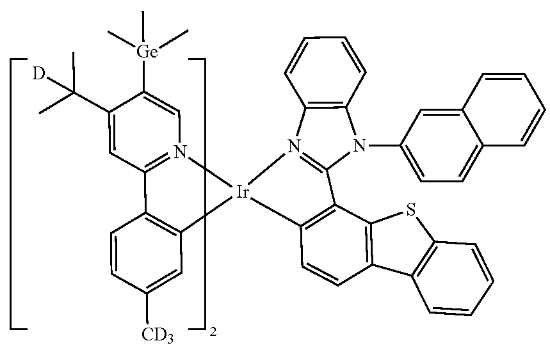
2947
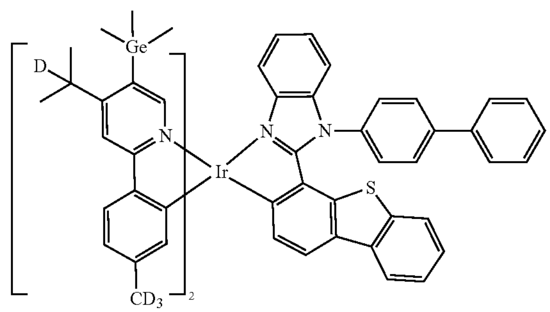
2948
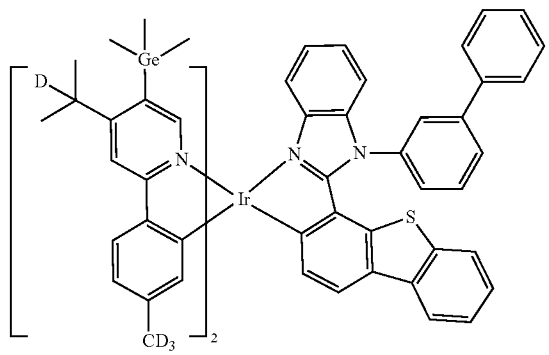
2949
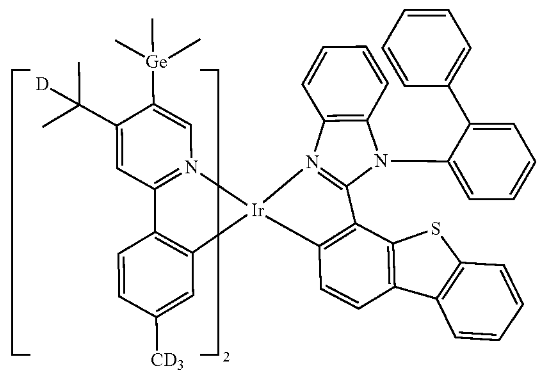

-continued
2950
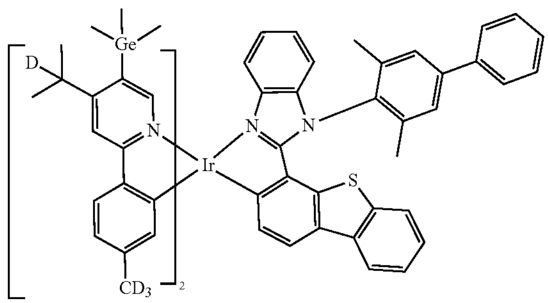
2951
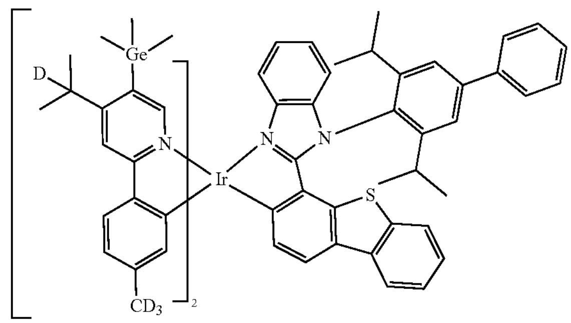
2952
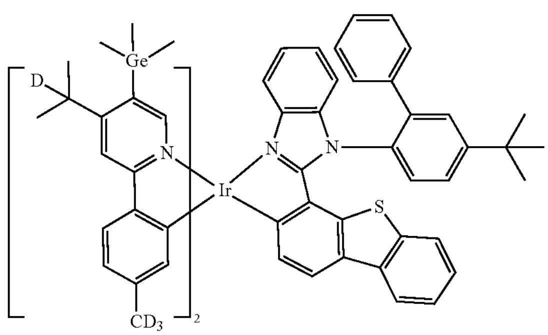
2953
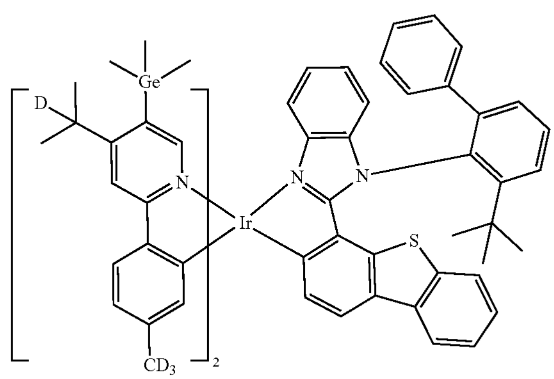
2954
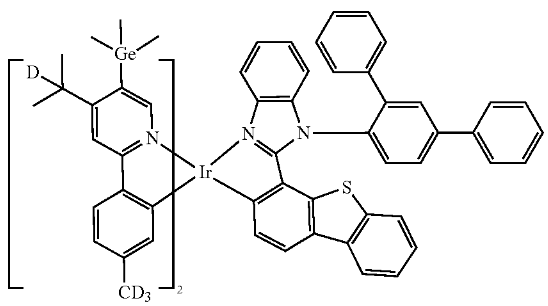
2955
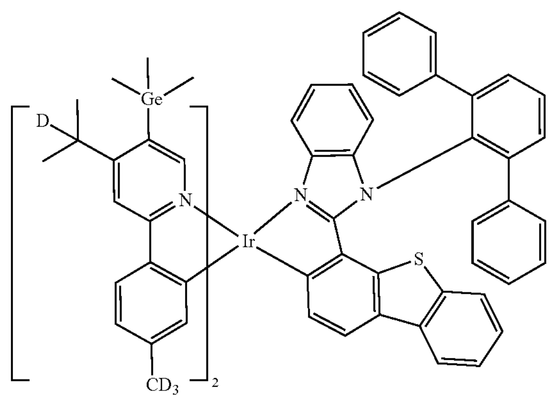
2956
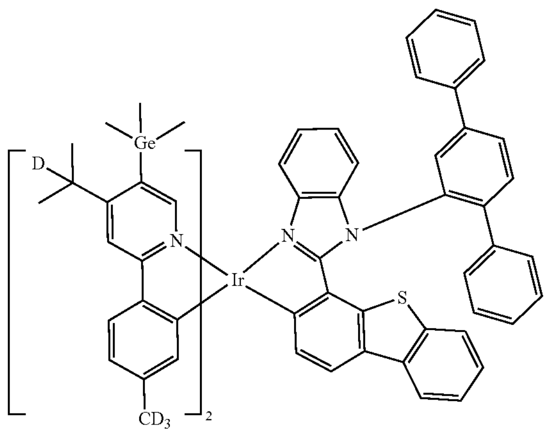
2957
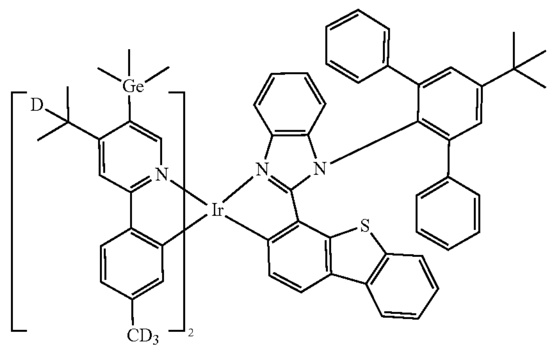

-continued
2958
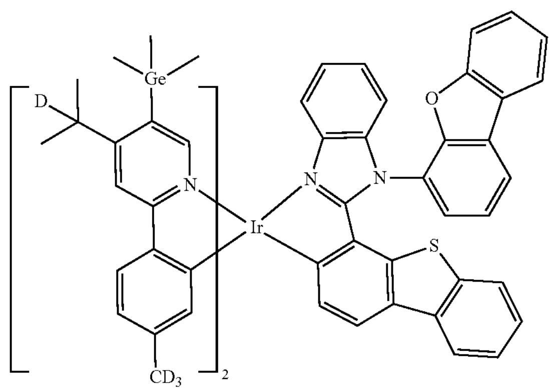
2959
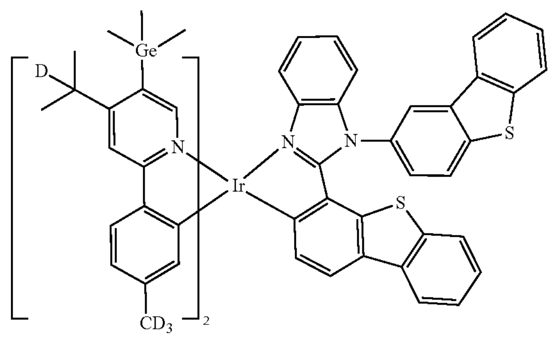
2960
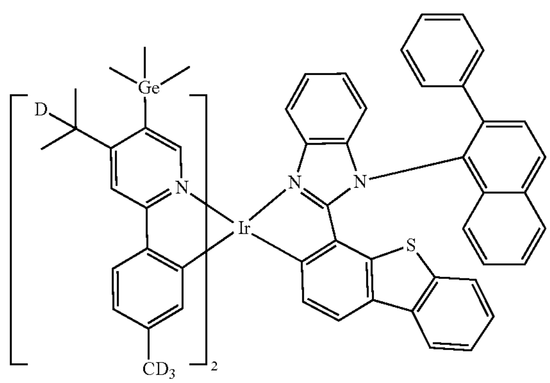
2961
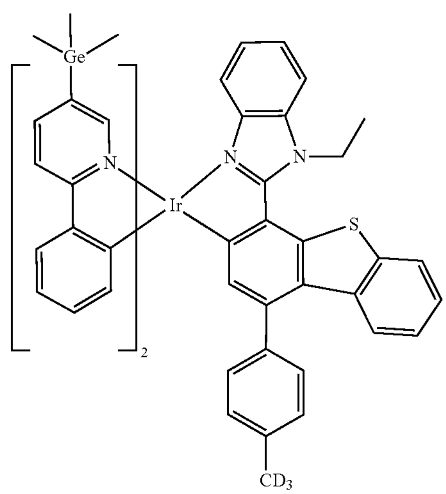
2962
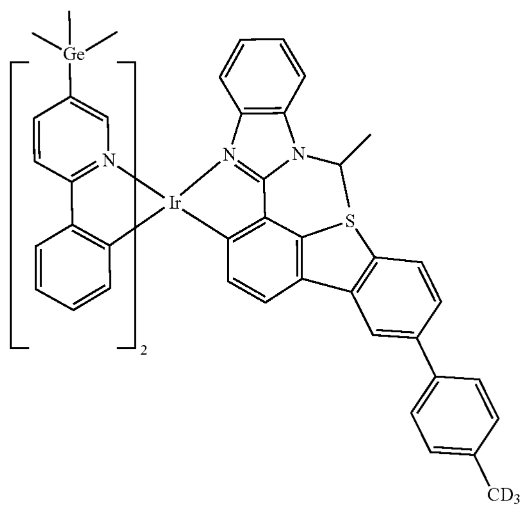
2963
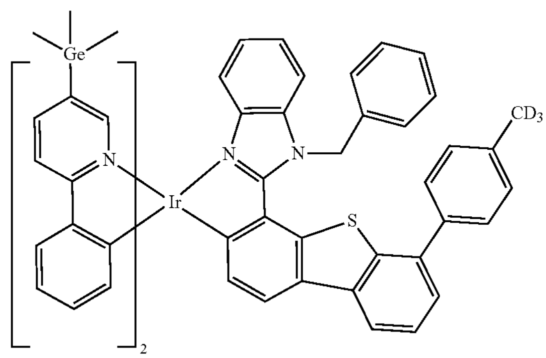

-continued
2964
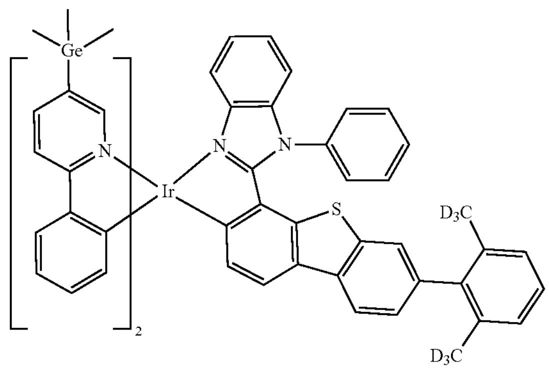
2965
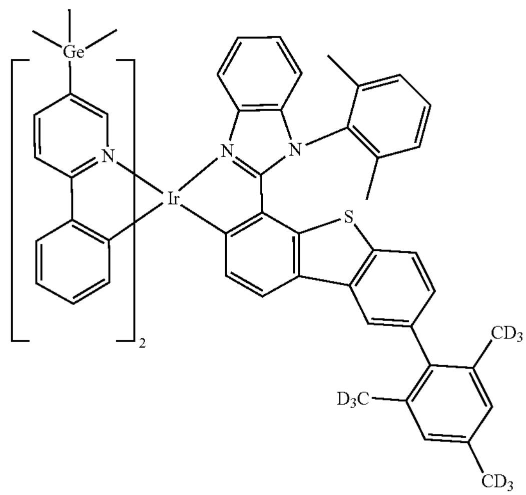
2966
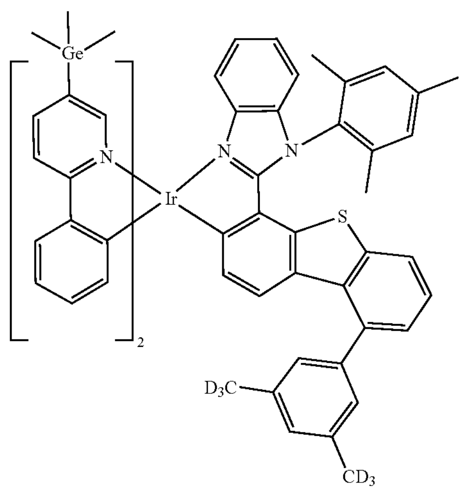
2967
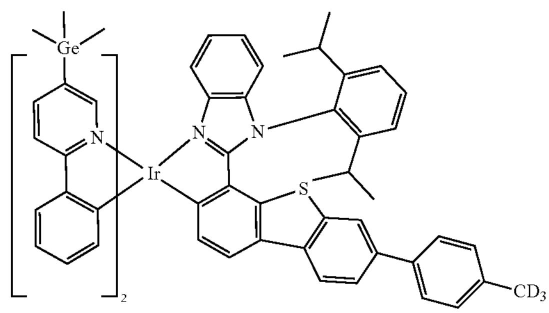
2968
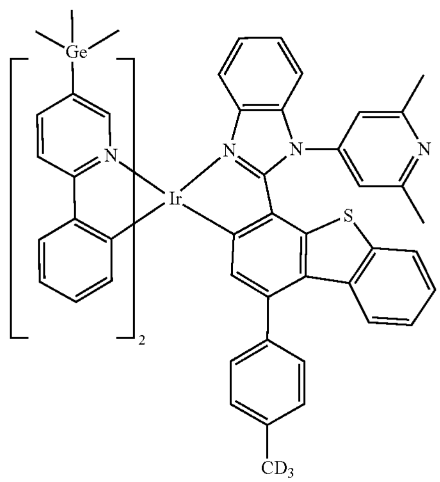
2969
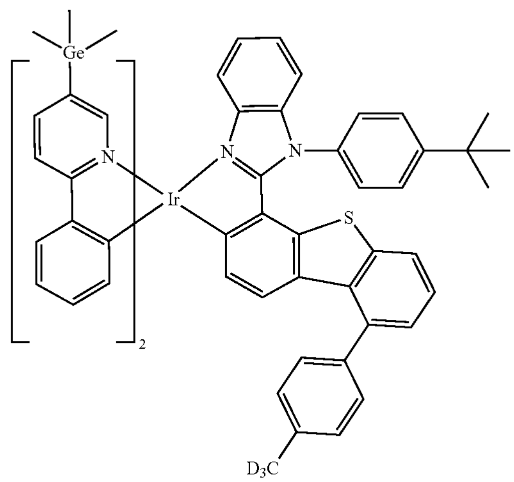

-continued
2970
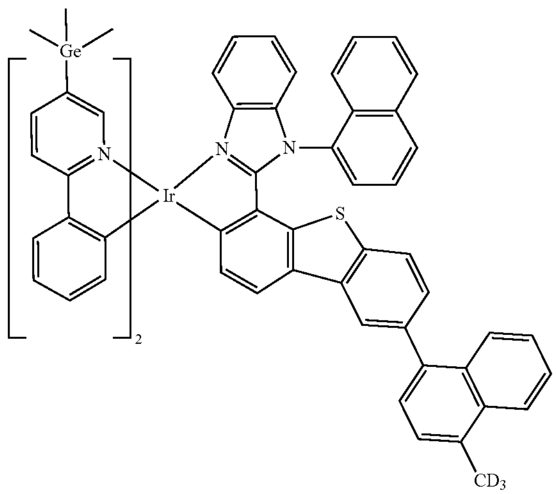
2971
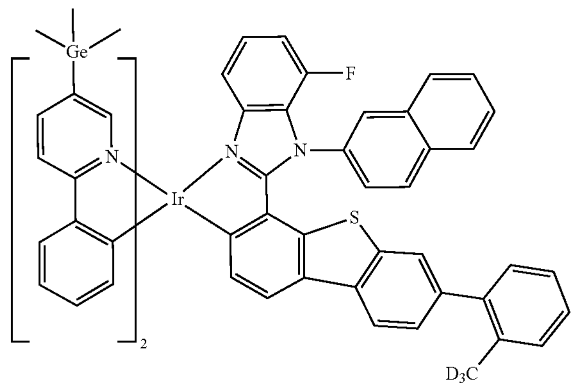
2972
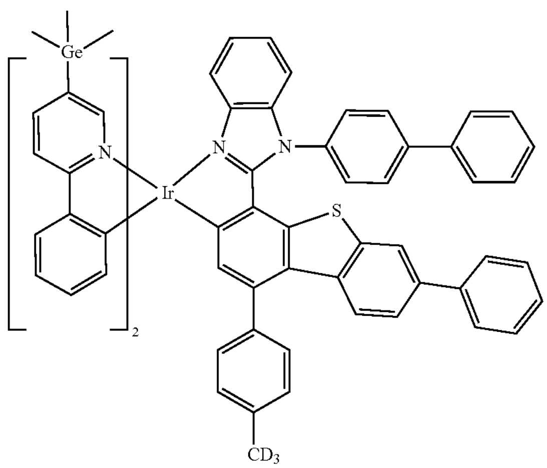
2973
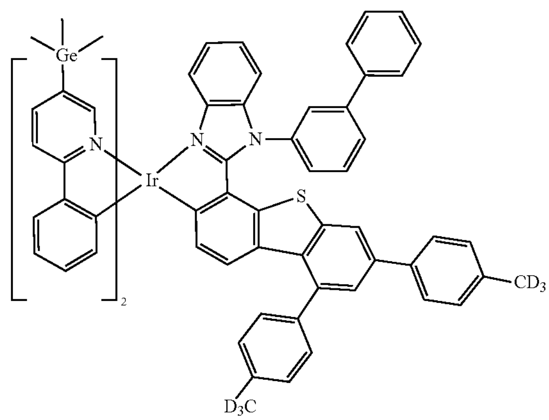
2974
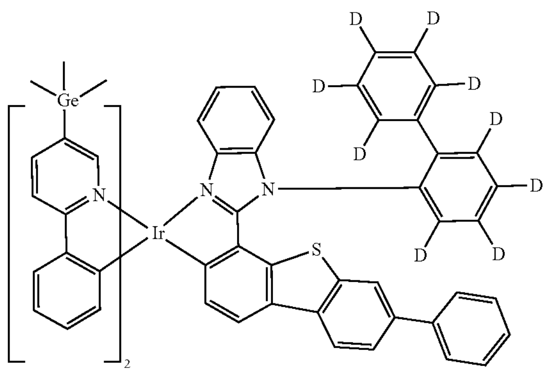
2975
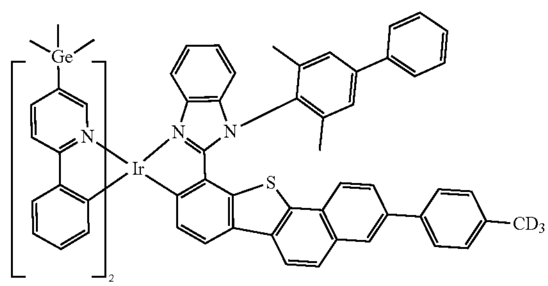

-continued
2976
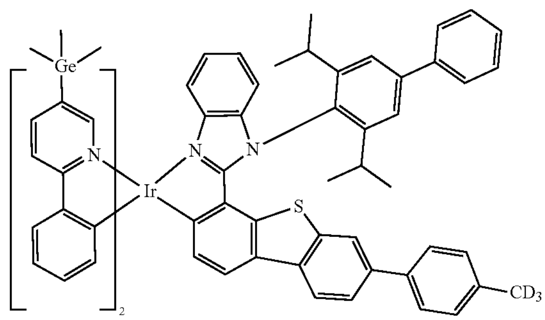
2977
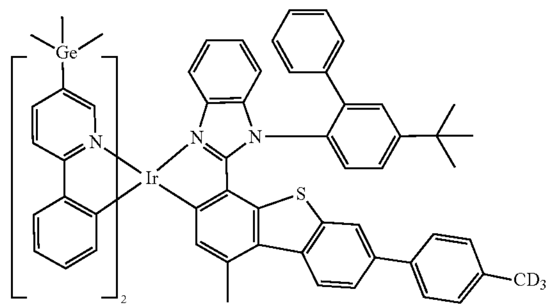
2978
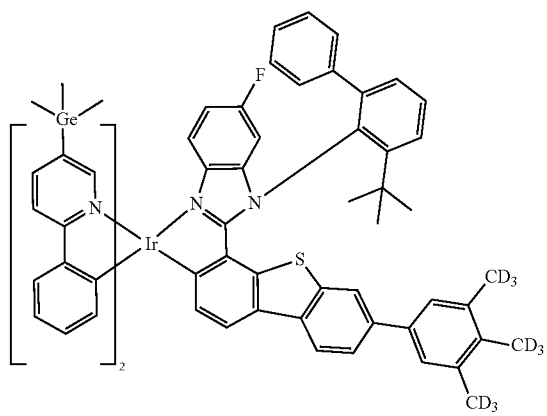
2979
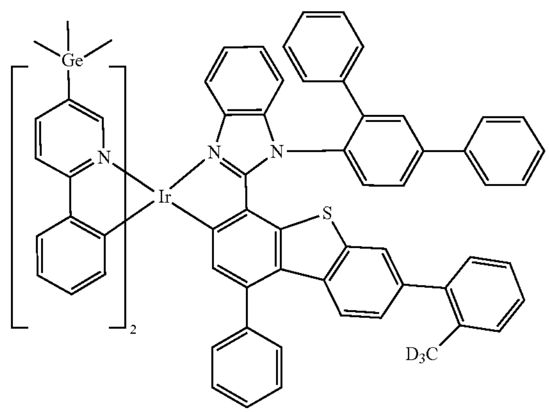
2980
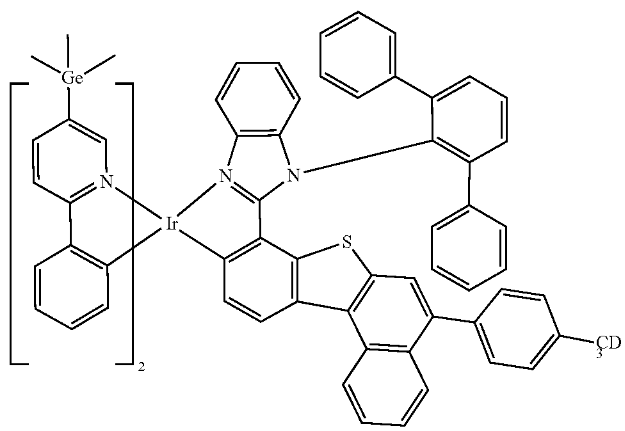

-continued
2981
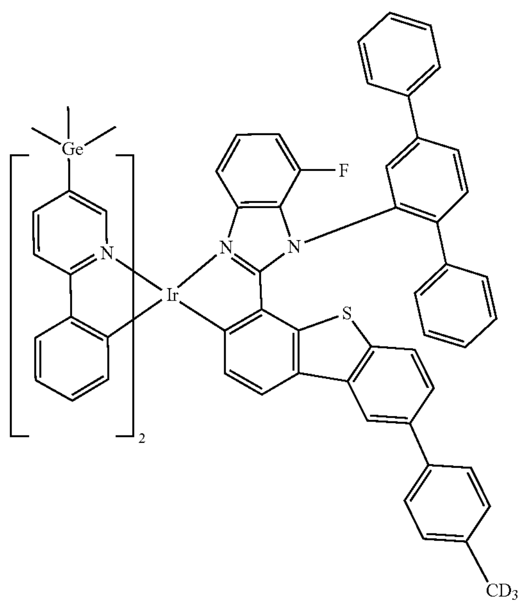
2982
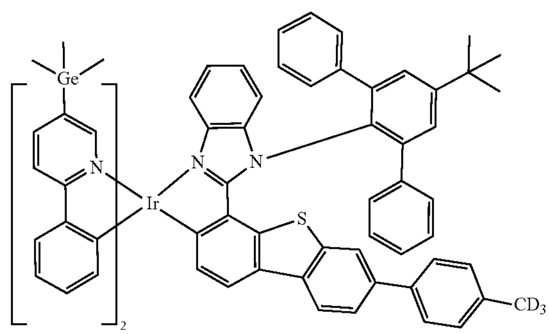
2983
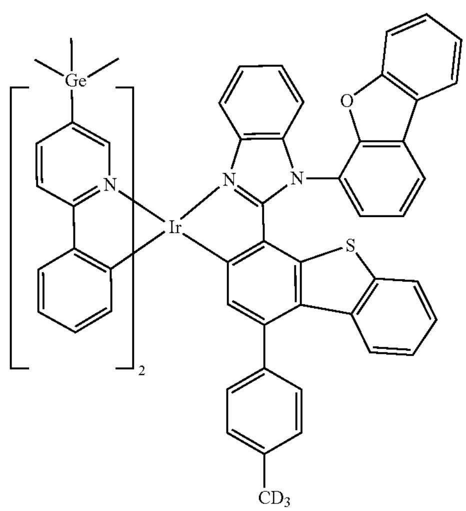
2984
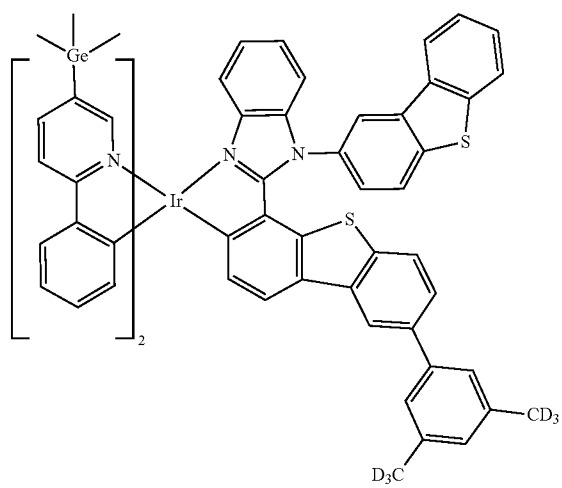
2985
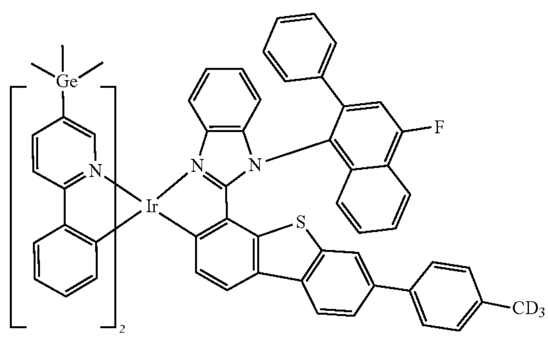
2986
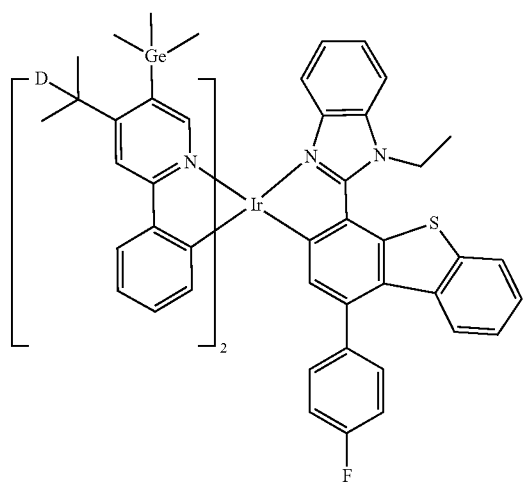

-continued
2987
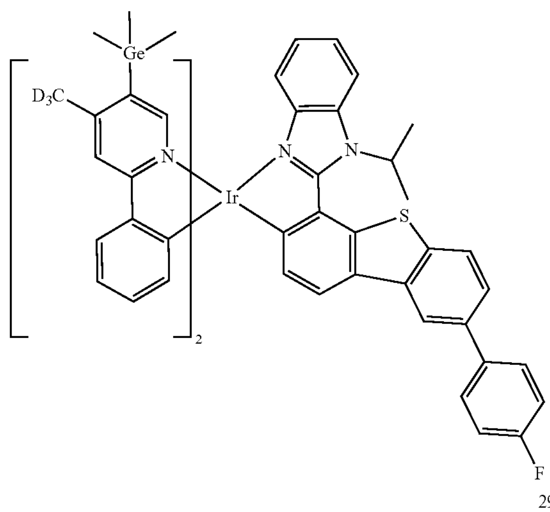
2988
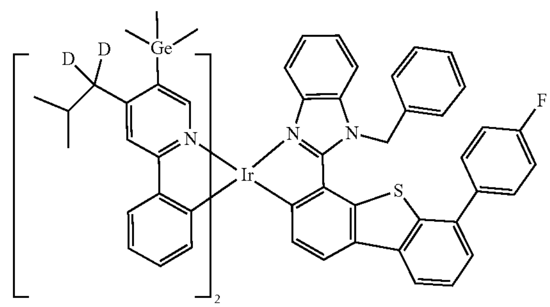
2989
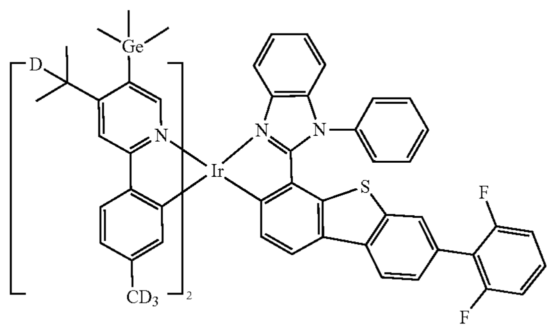
2990
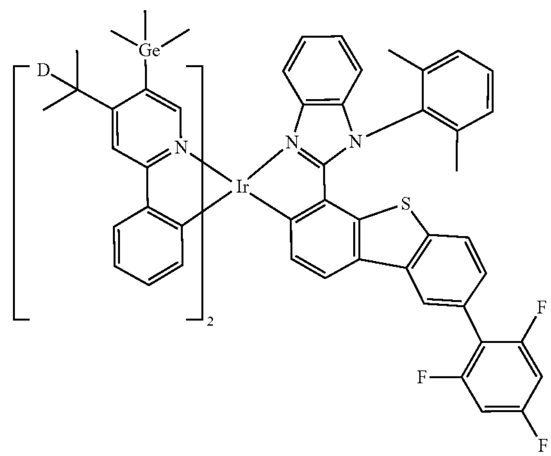
2991
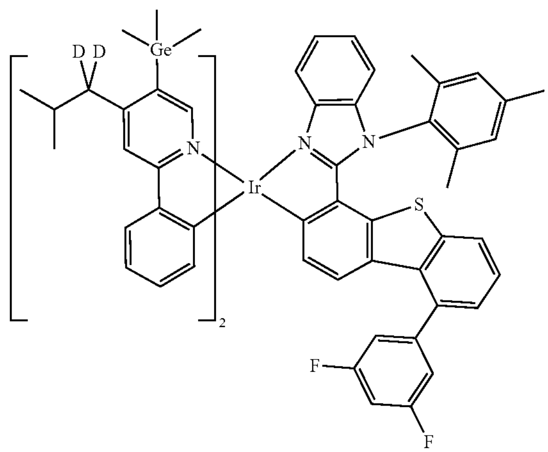
2992
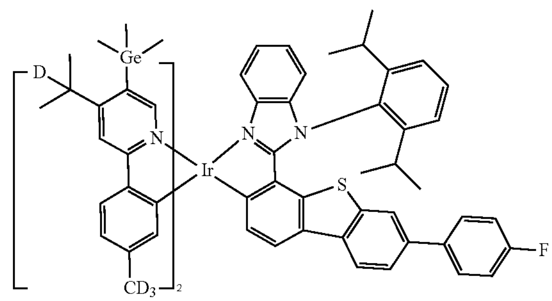

-continued
2990
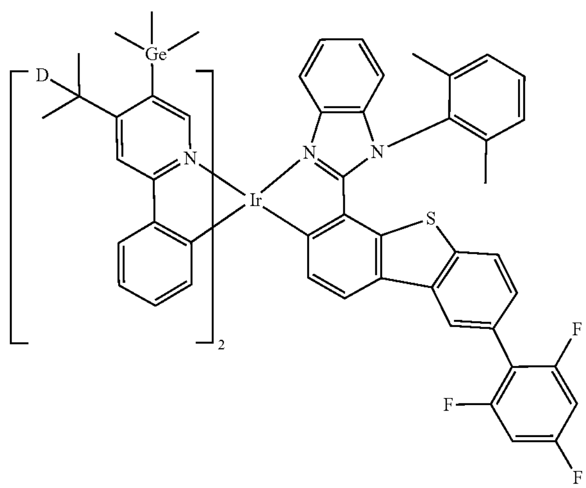
2993
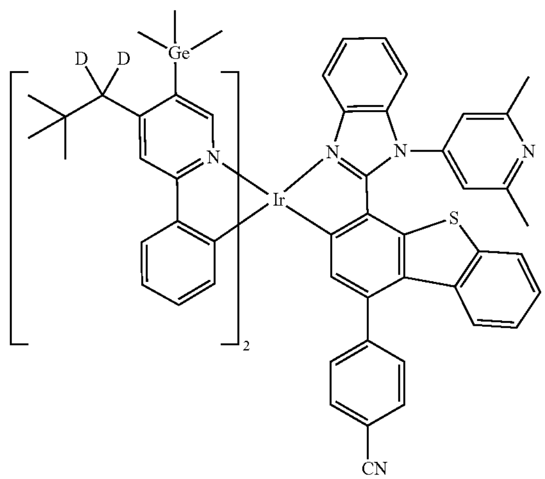
2994
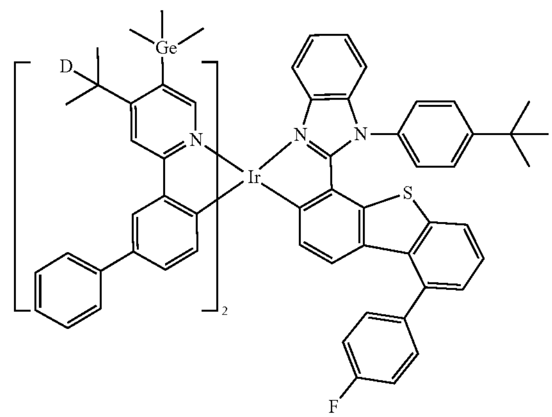
2995
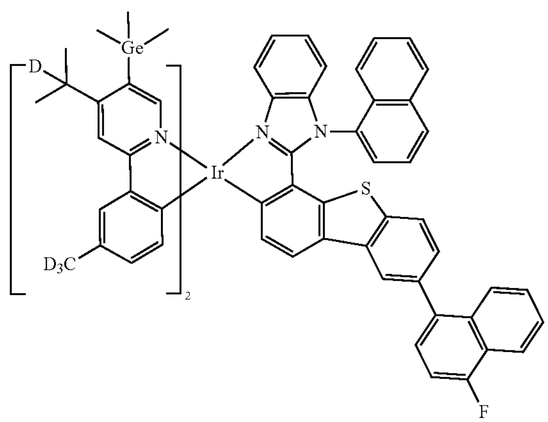
2996
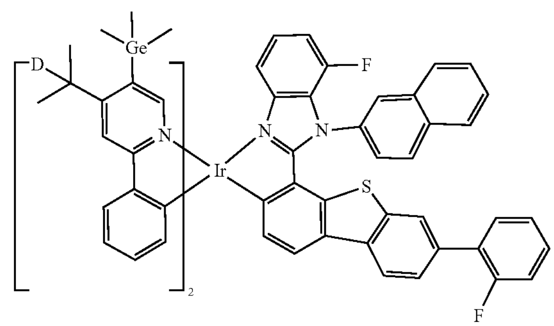

-continued
2997
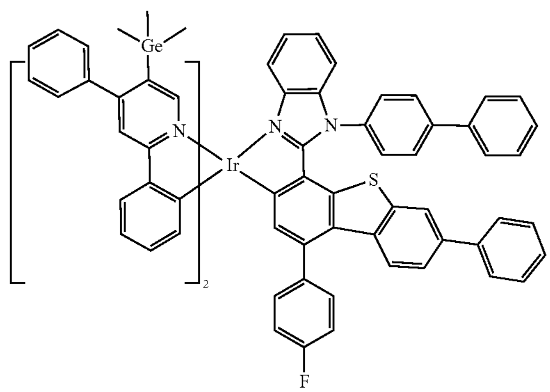
2998
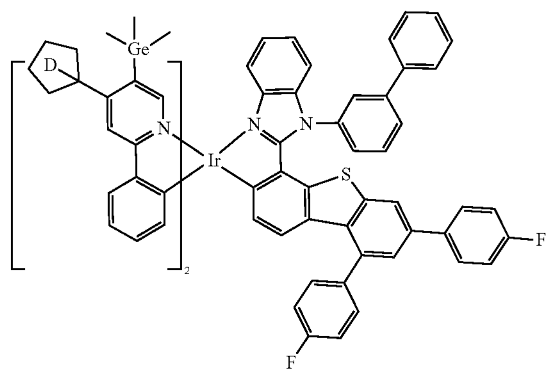
2999
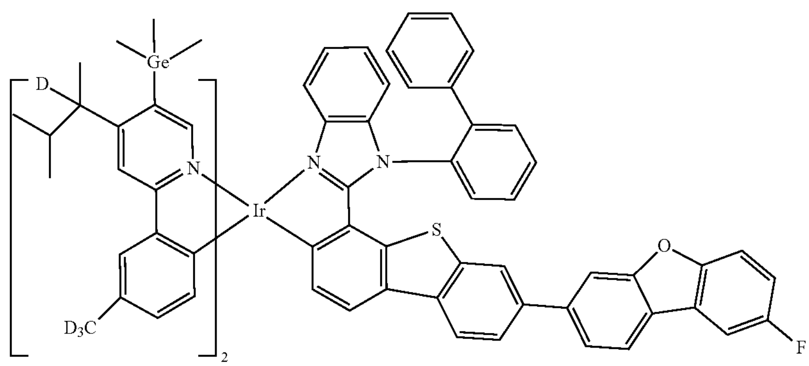
3000
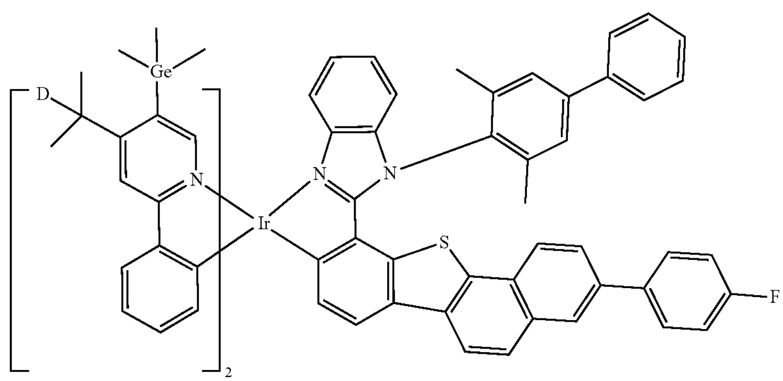
3001
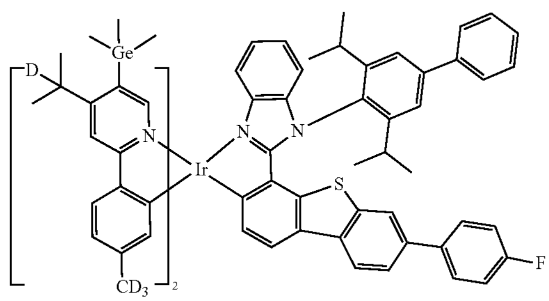
3002
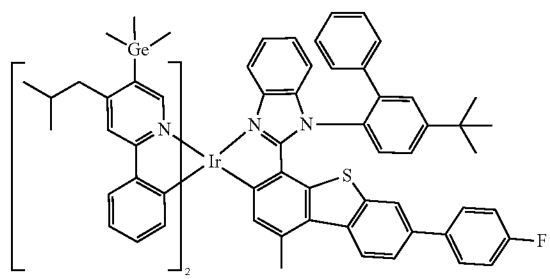

-continued
3003
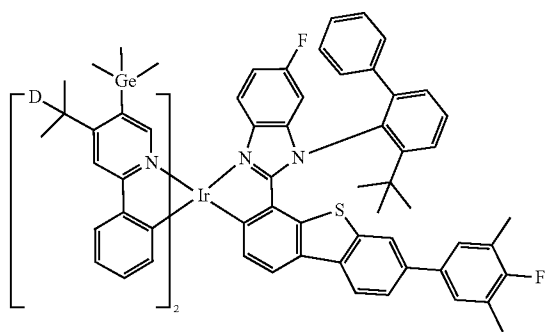
3004
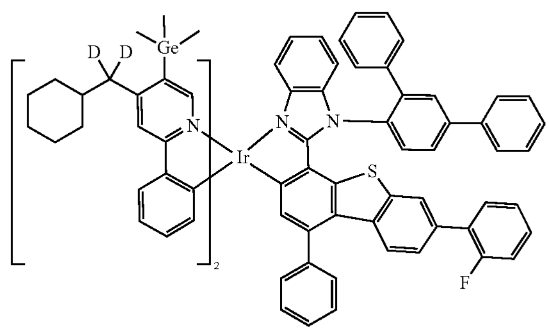
3005
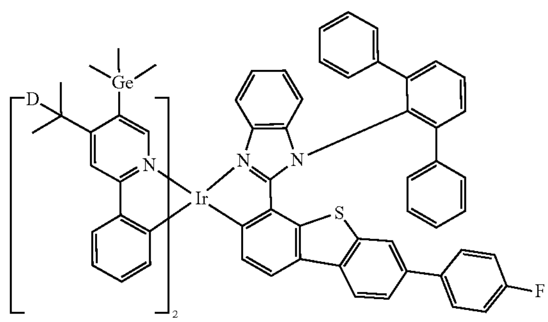
3006
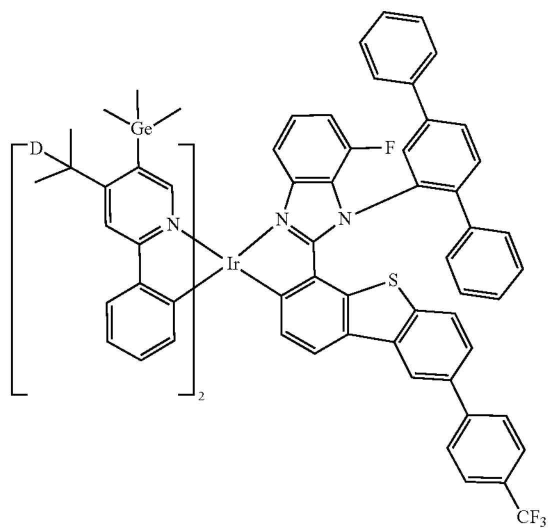
3007
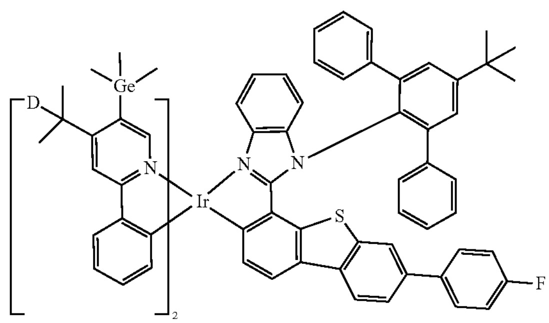
3008
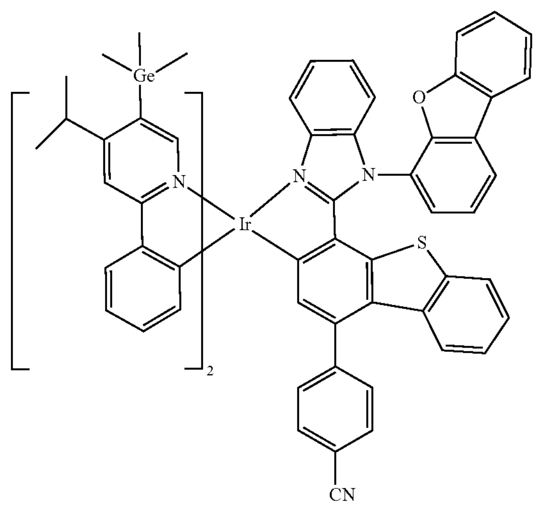

-continued
3009
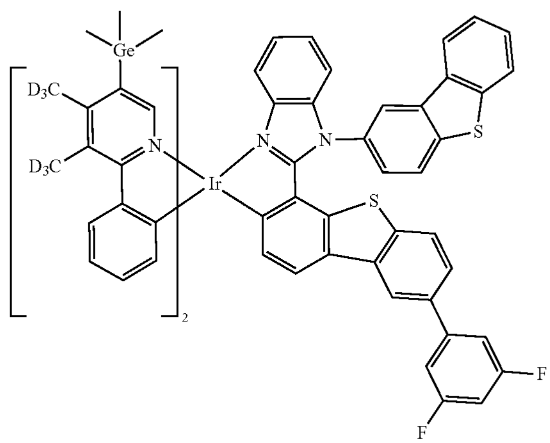
3010
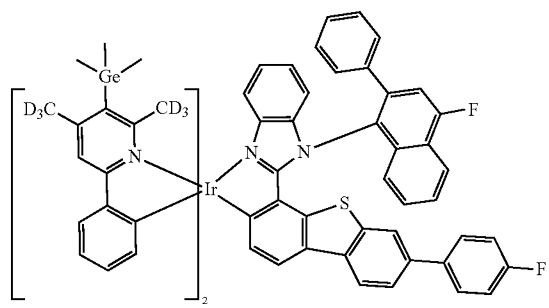
3011
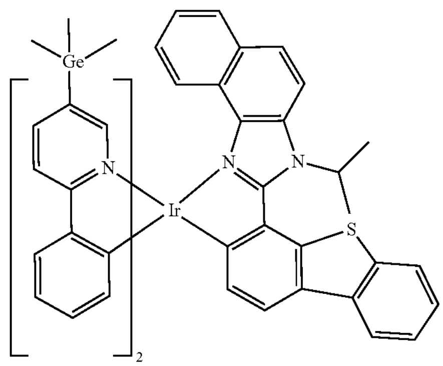
3012
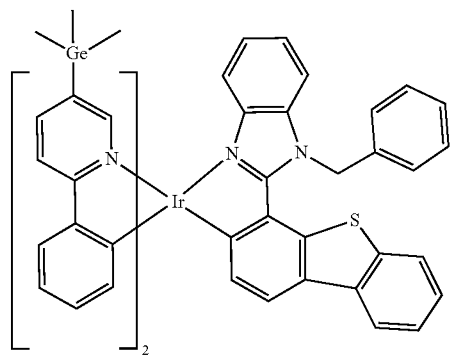
3013
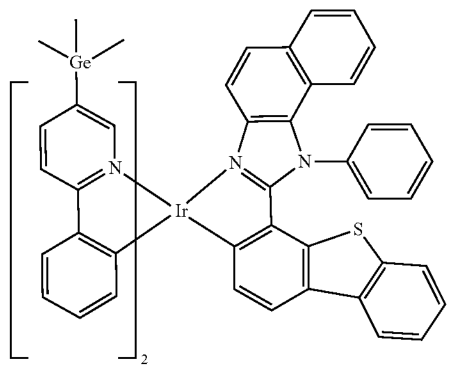
3014
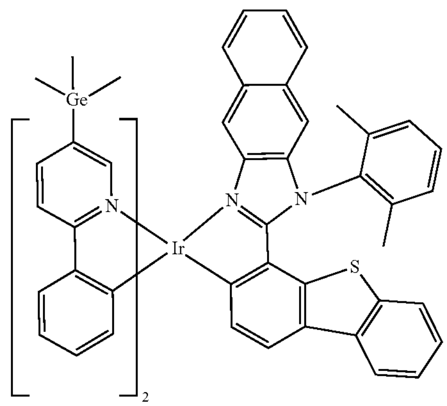
3015
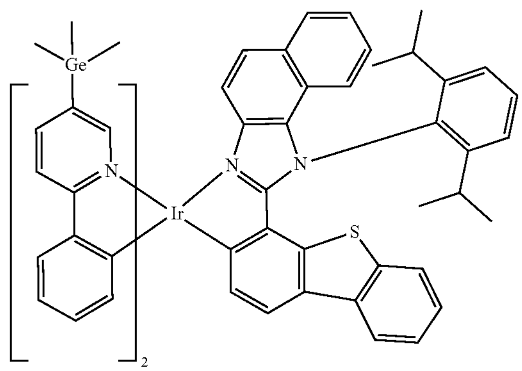
3016
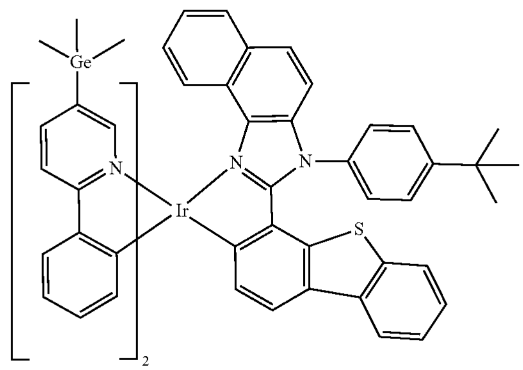

-continued
3017
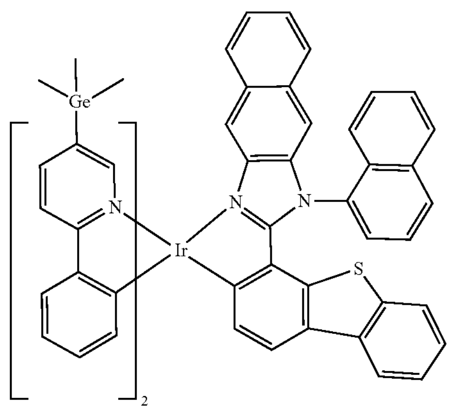
3018
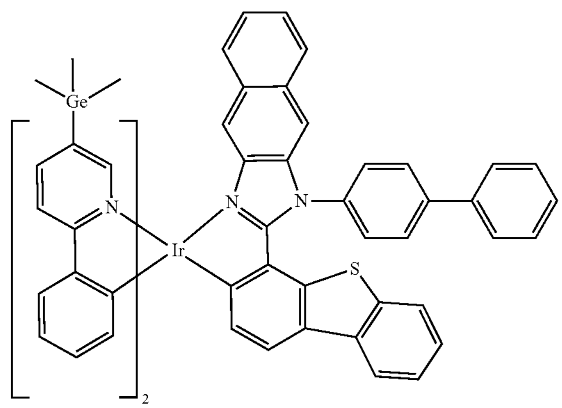
3019
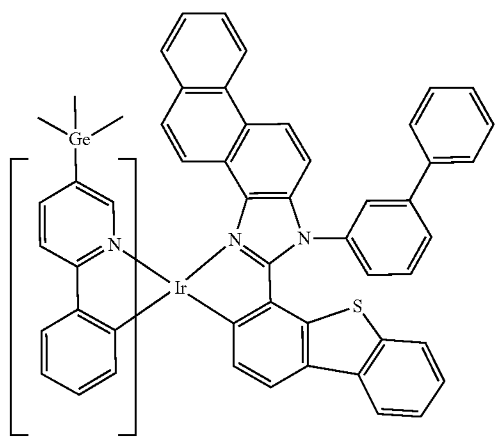
3020
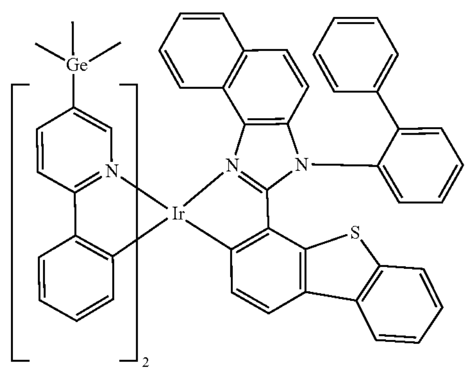
3021
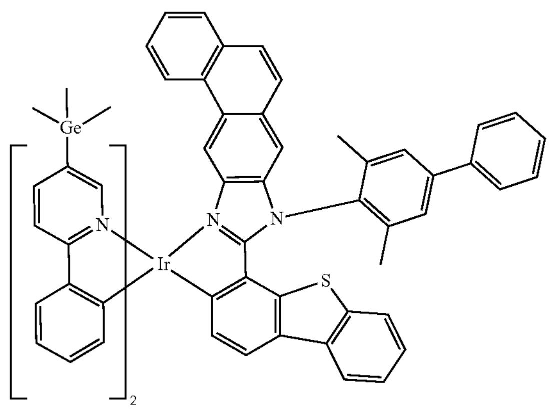
3022
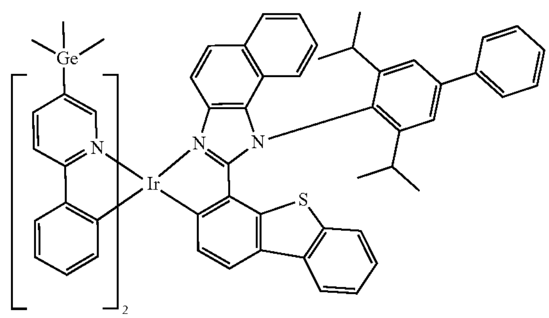

-continued
3023
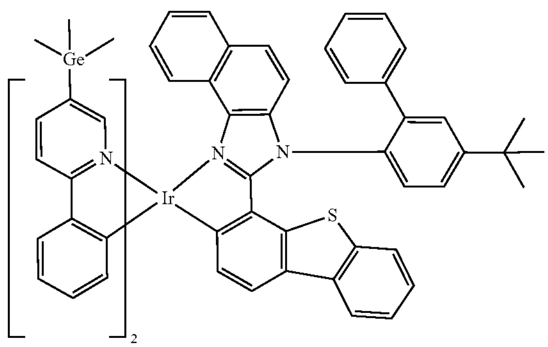
3024
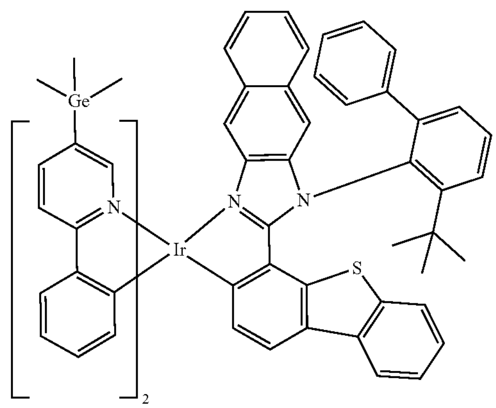
3025
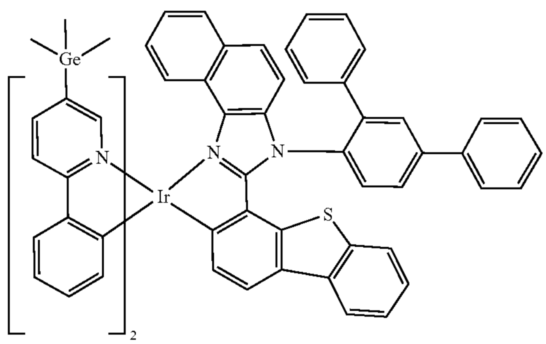
3026
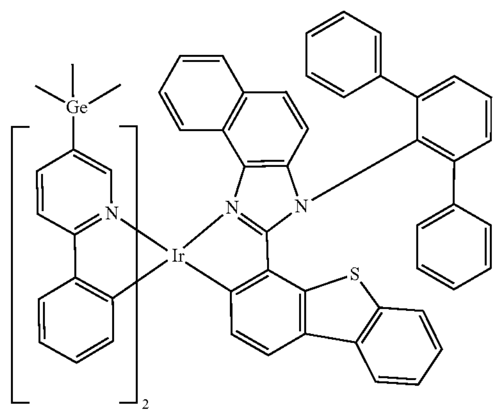
3027
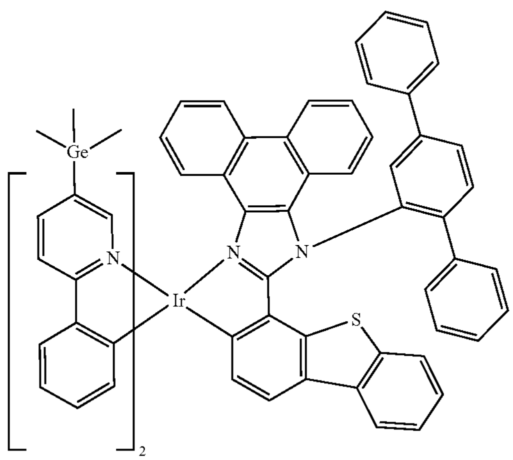

-continued
3028
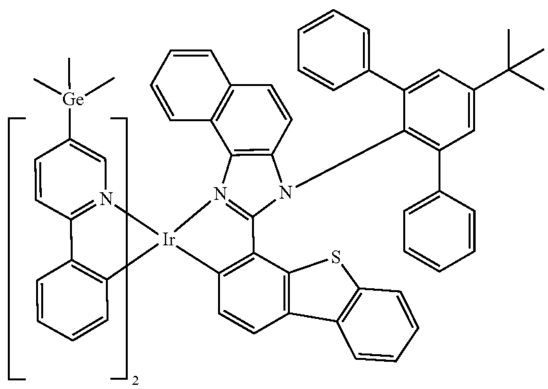
3029
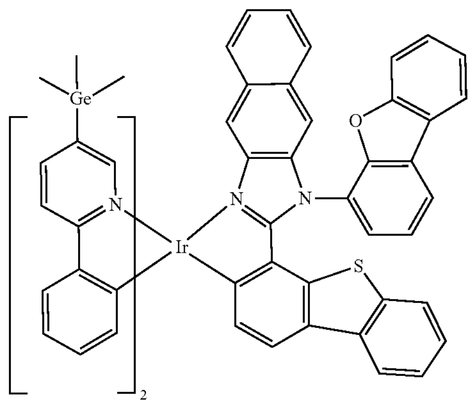
3030
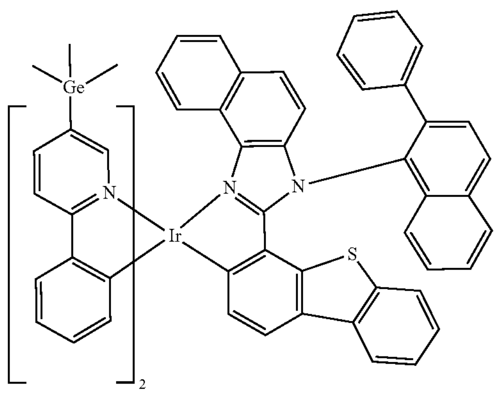
3031
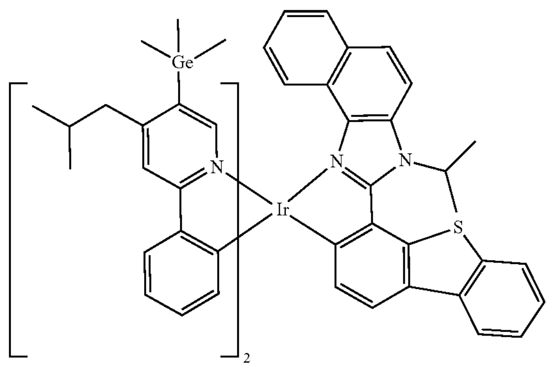
3032
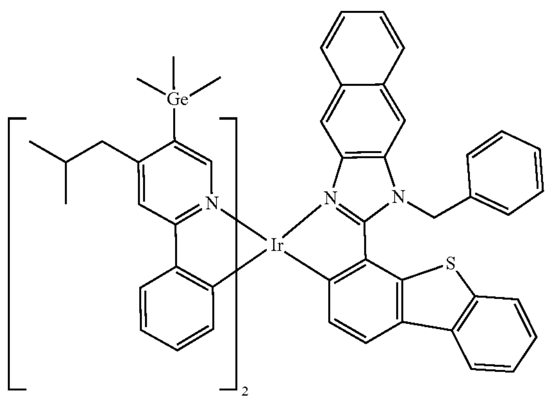
3033
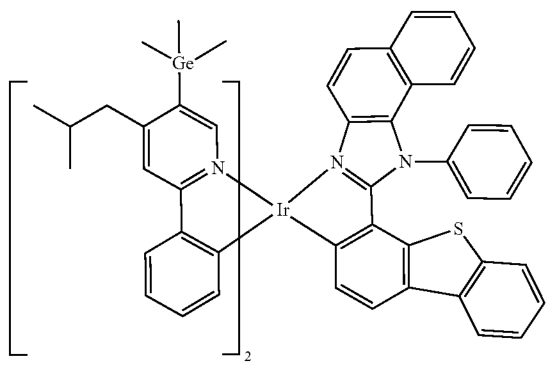

-continued
3034
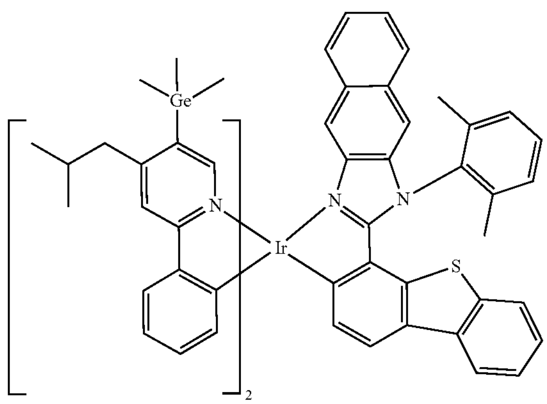
3035
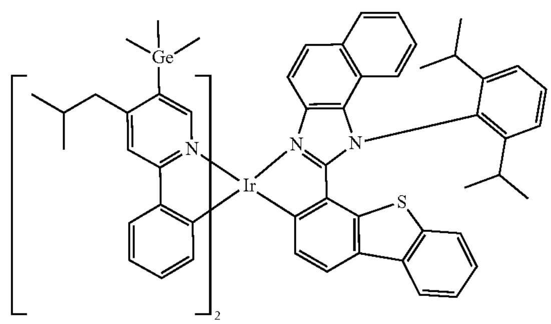
3036
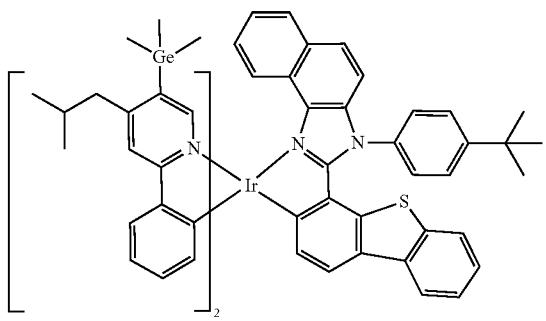
3037
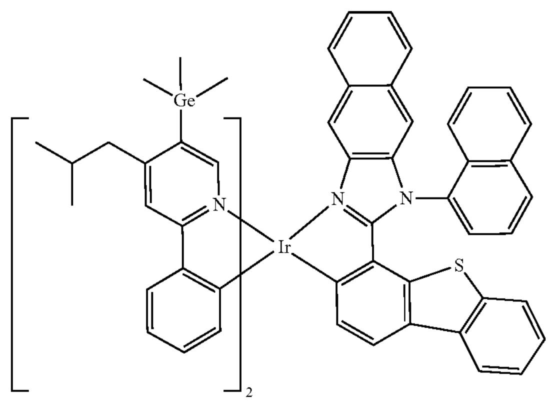
3038
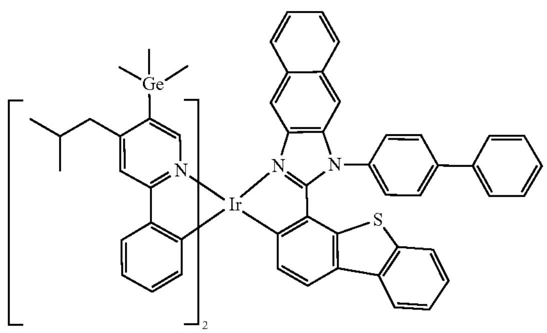
3039
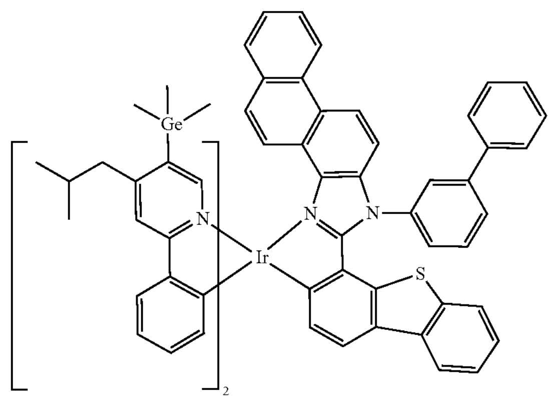
3040
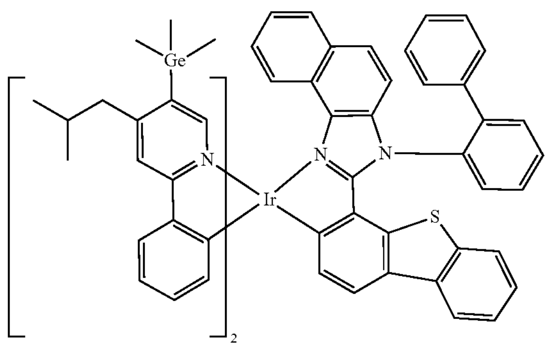
3041
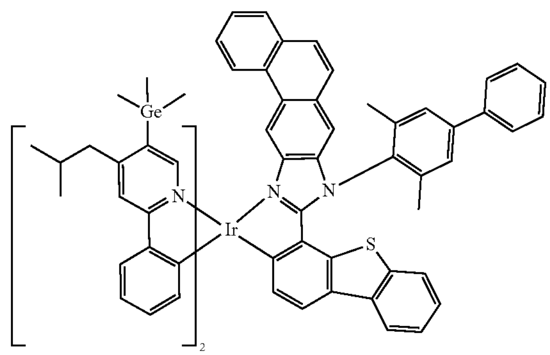

-continued
3042
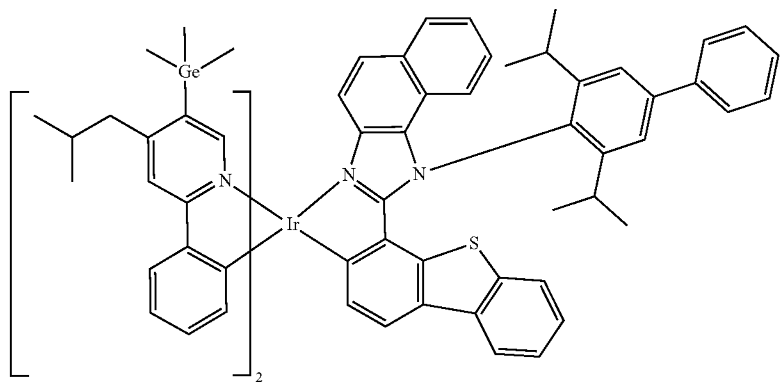
3043
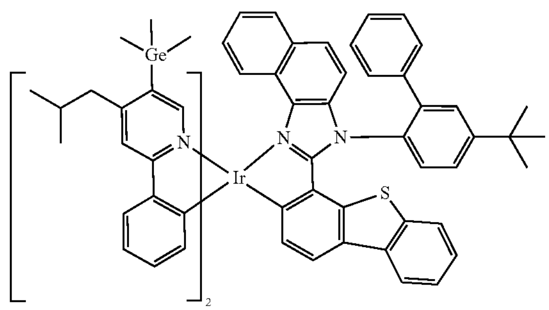
3044
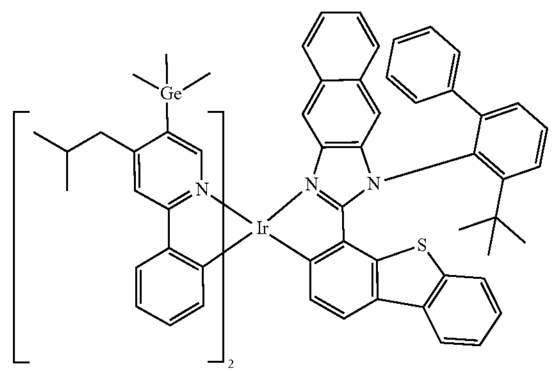
3045
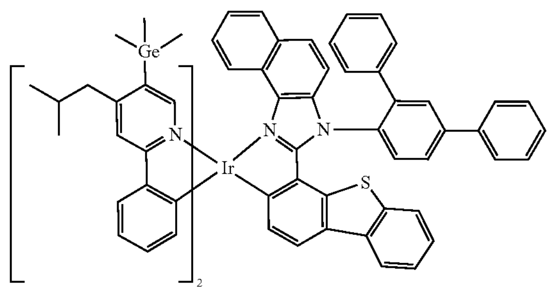
3046
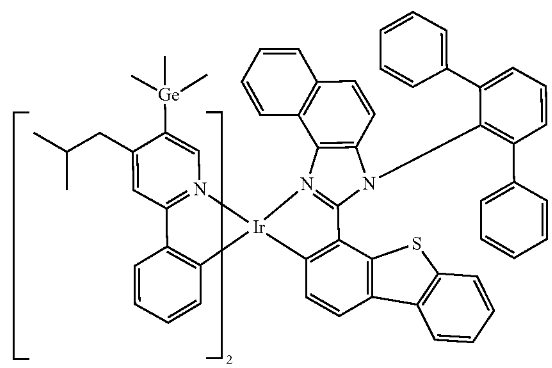
3047
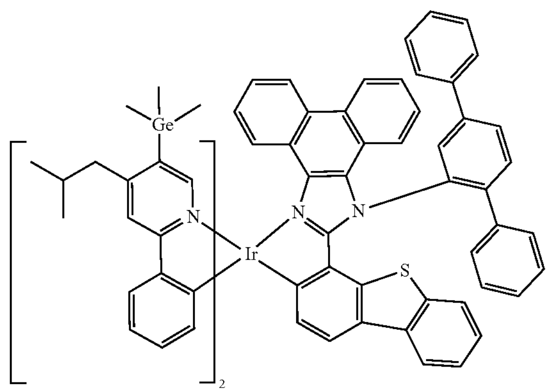
3048
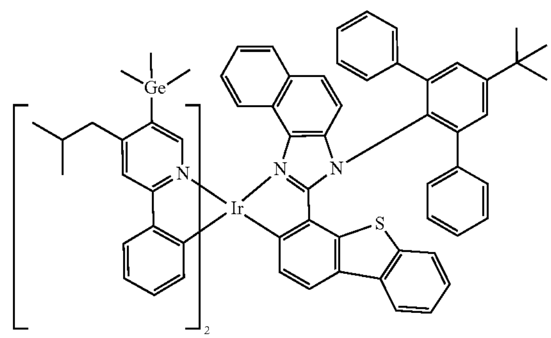

-continued
3049
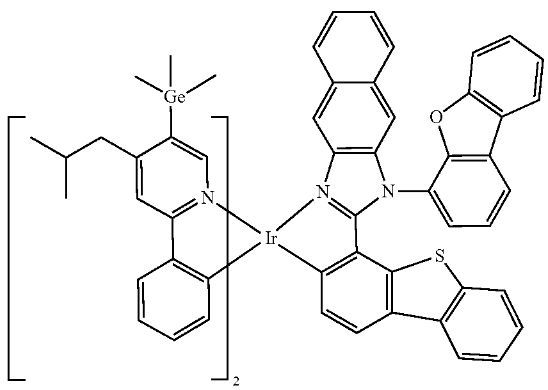
3050
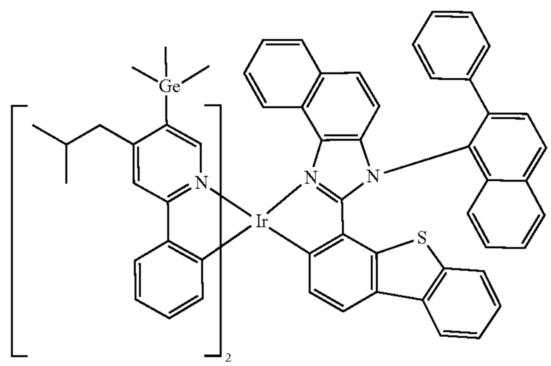
3051
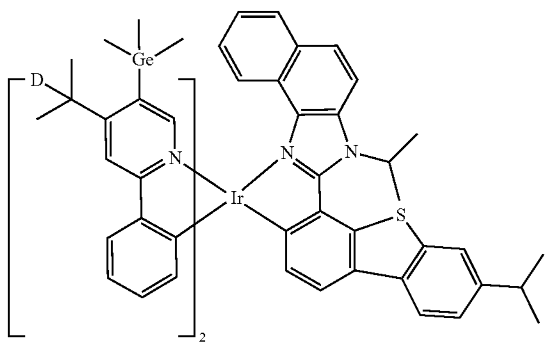
3052
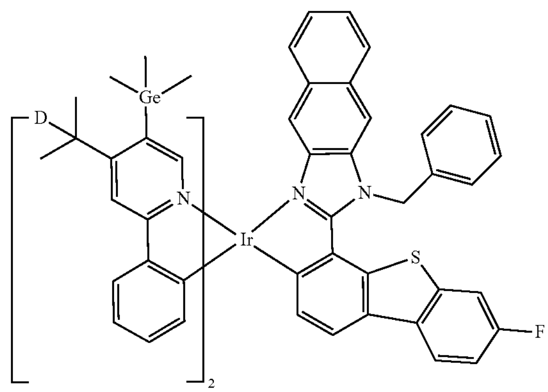
3053
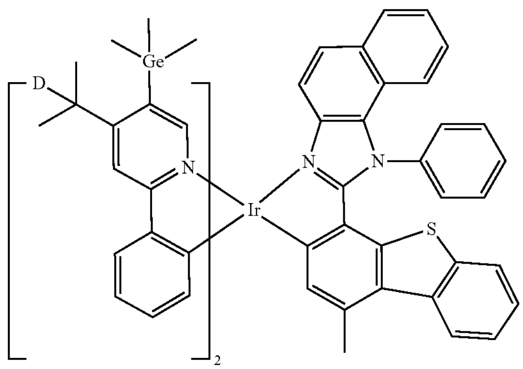
3054
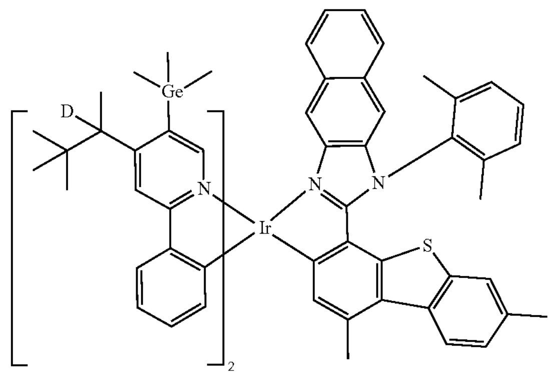
3055
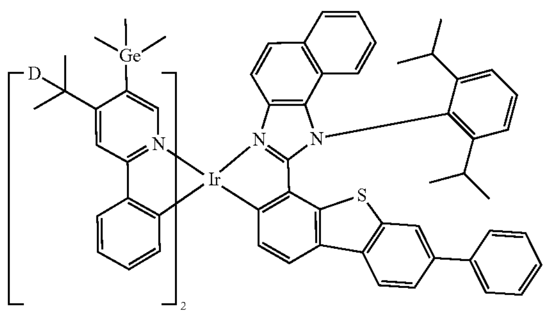
3056
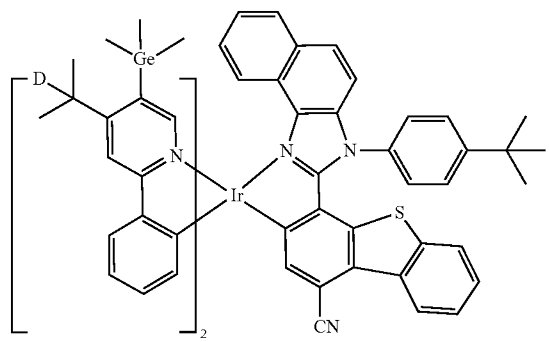

-continued
3057
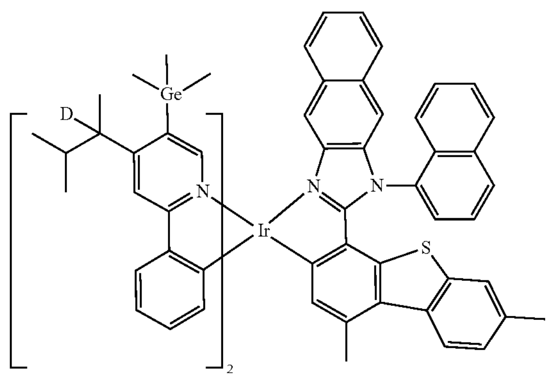
3058
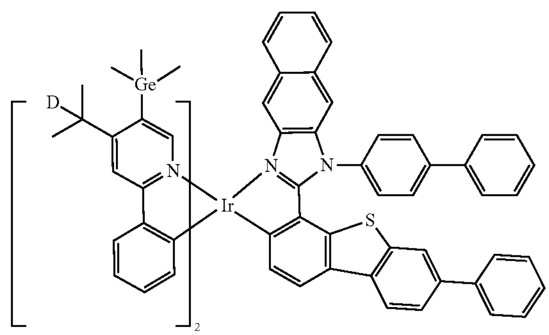
3059
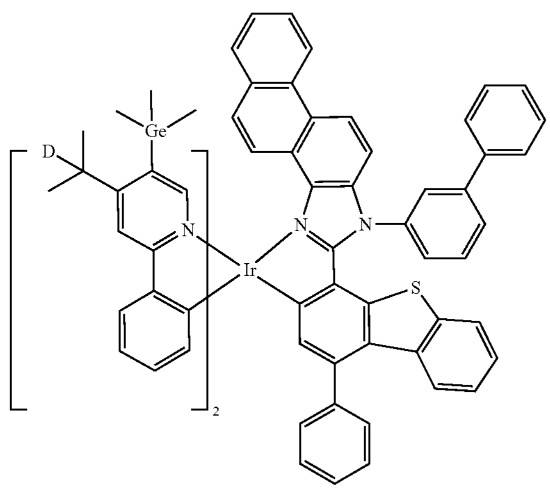
3060
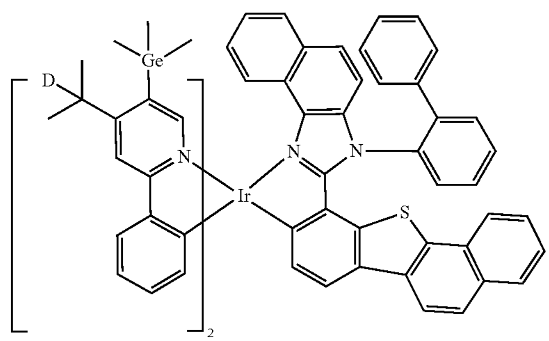
3061
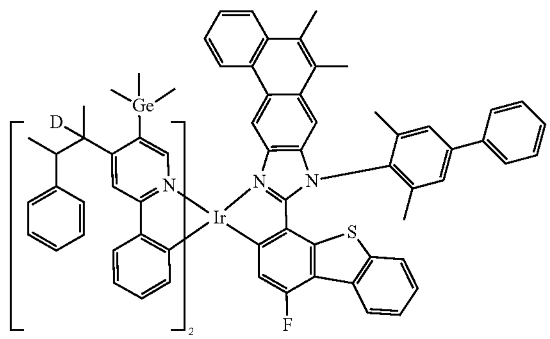
3062
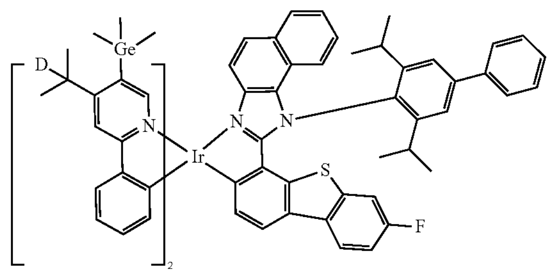
3063
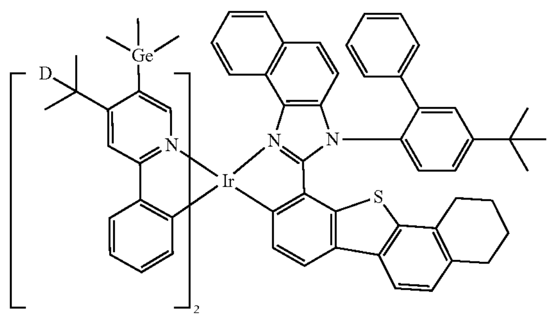
3064
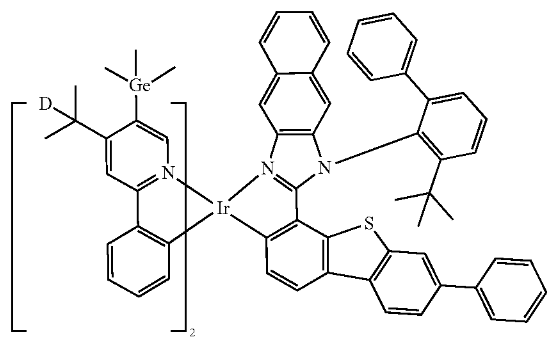

-continued
3065
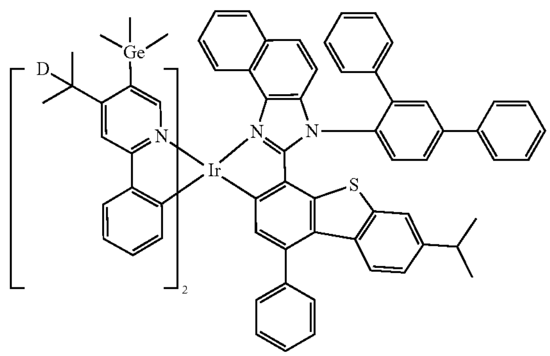
3066
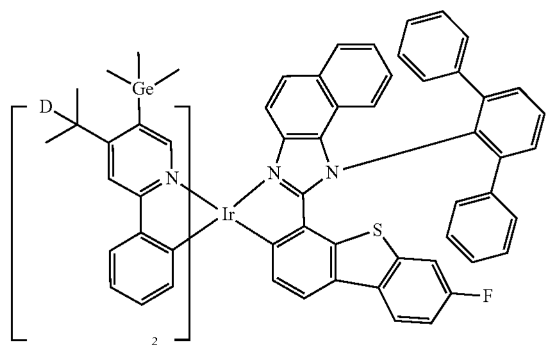
3067
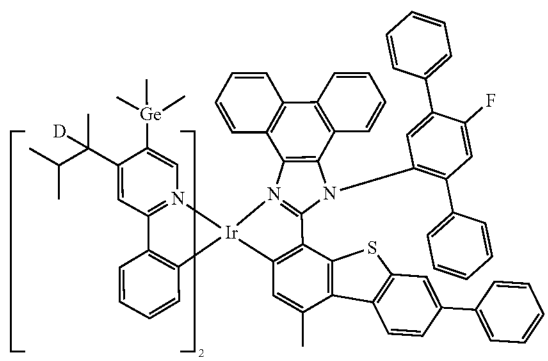
3068
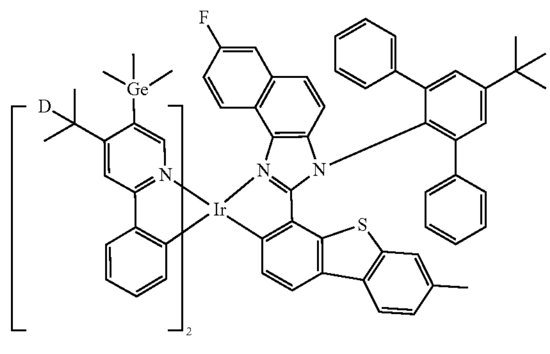
3069
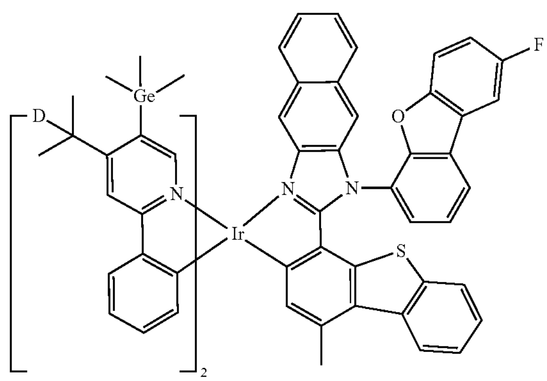
3070
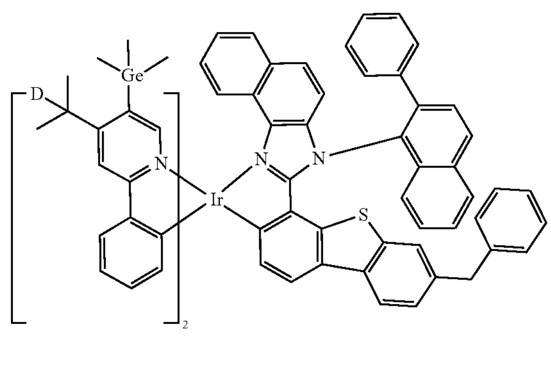
3071
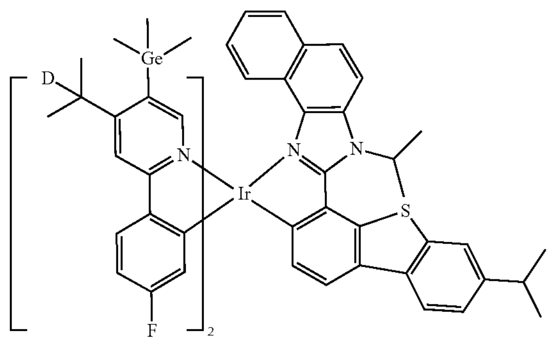
3072
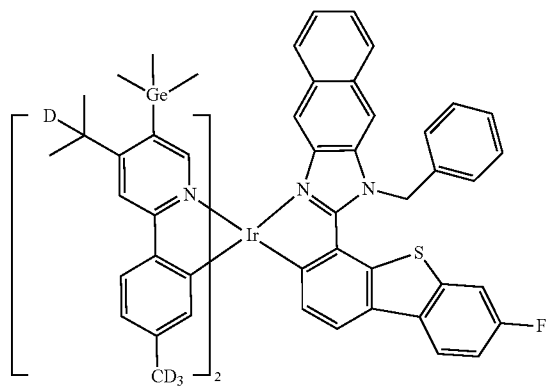

-continued
3073
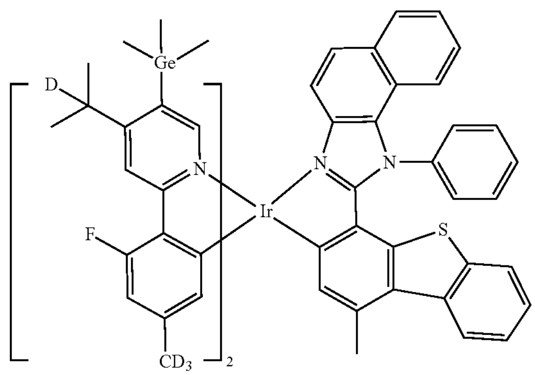
3074
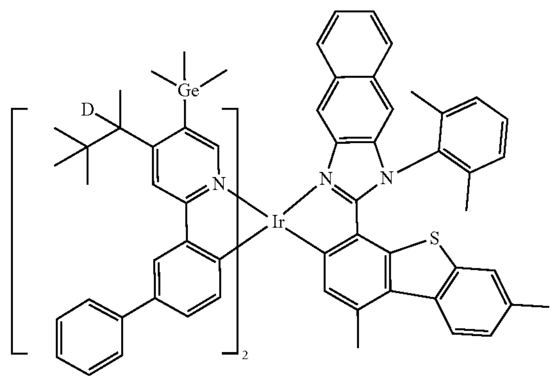
3075
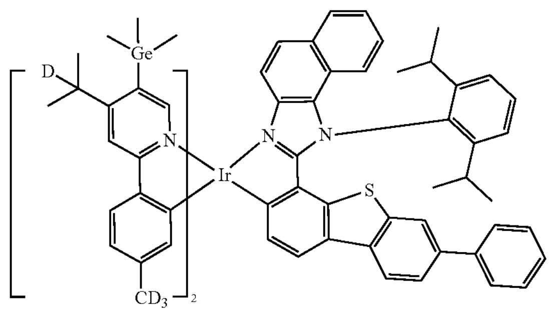
3076
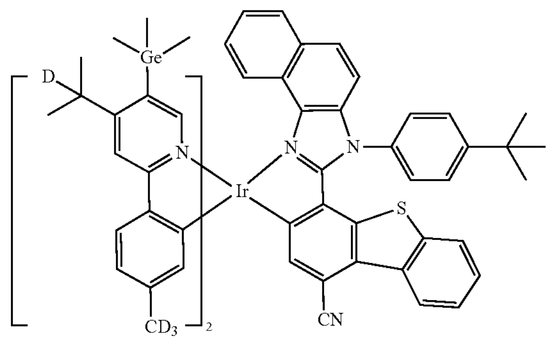
3077
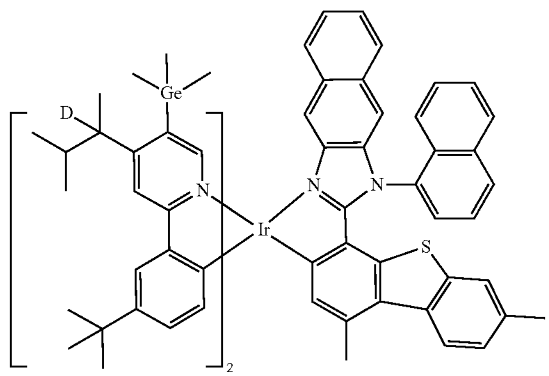
3078
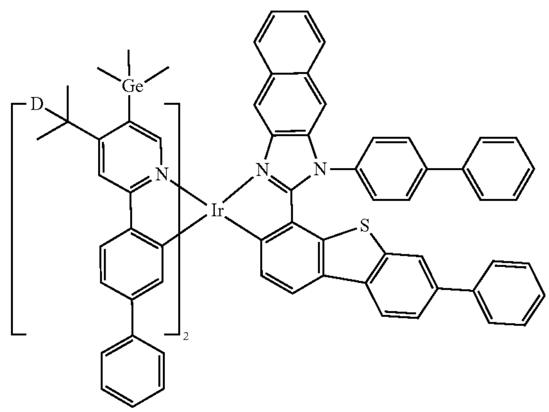

-continued
3079
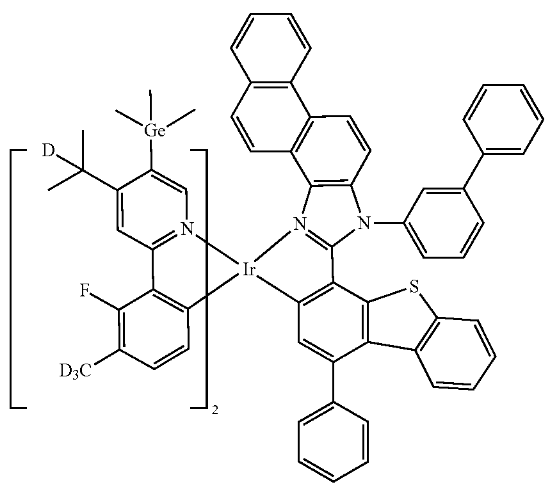
3080
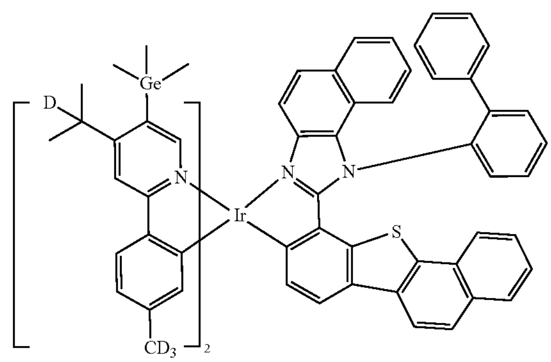
3081
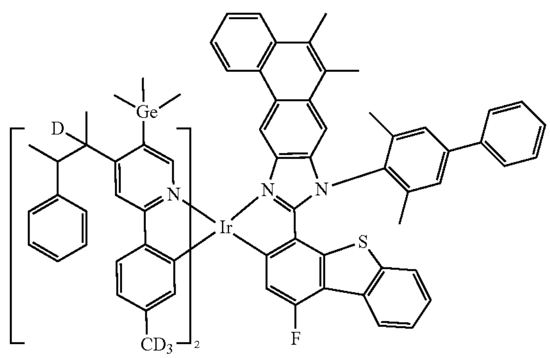
3082
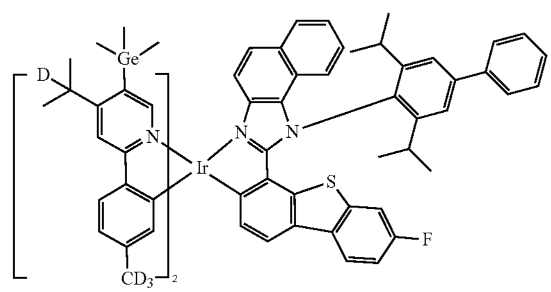
3083
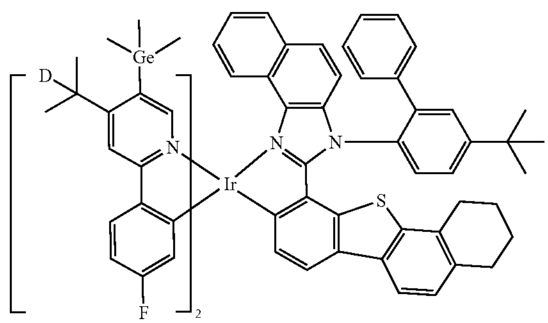
3084
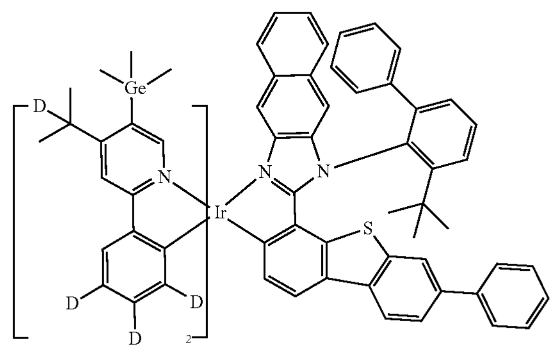
3085
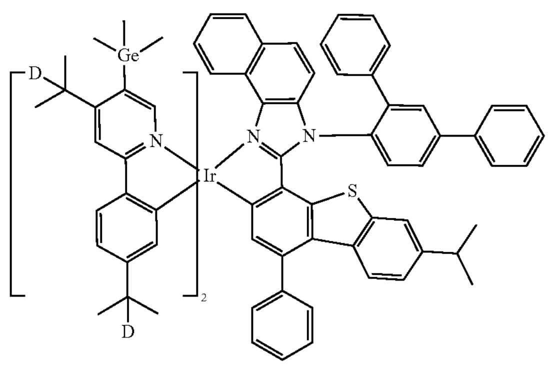
3086
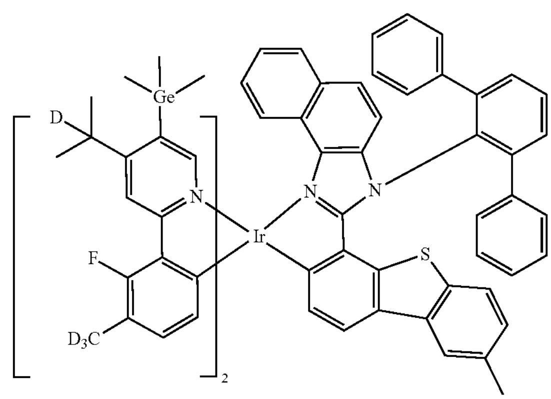

-continued
3087
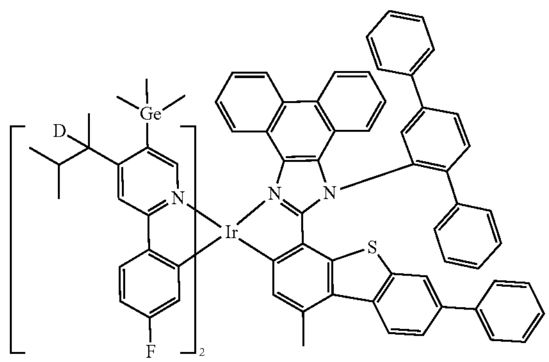
3088
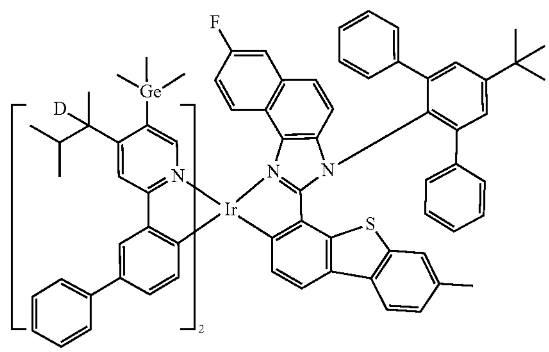
3089
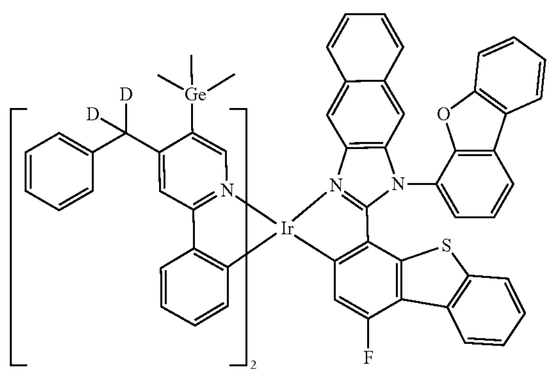
3090
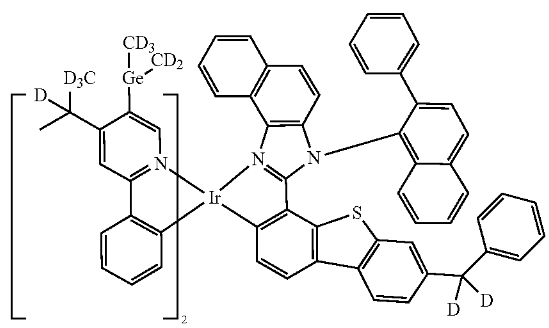
3091
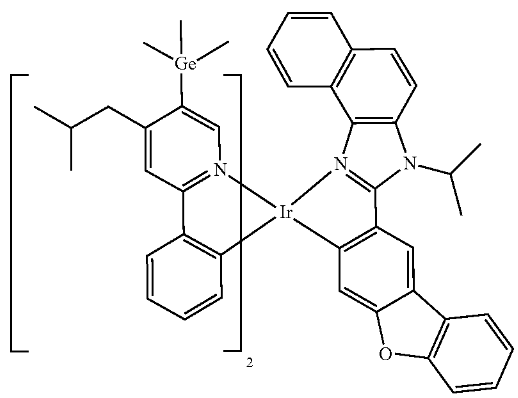
3092
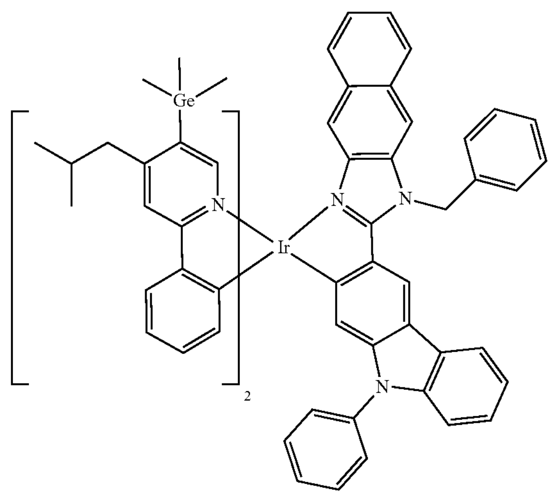

-continued
3093
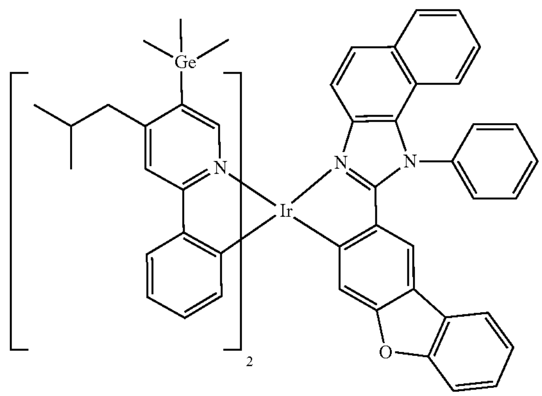
3094
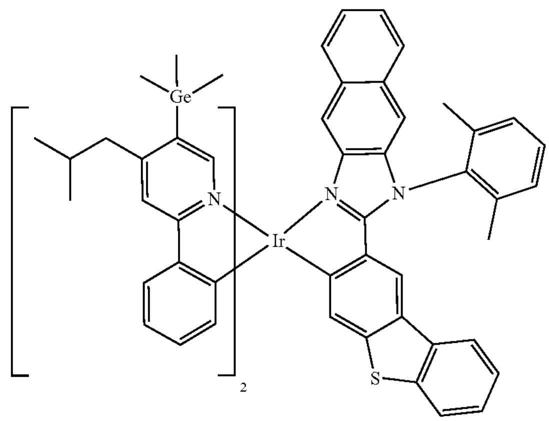
3095
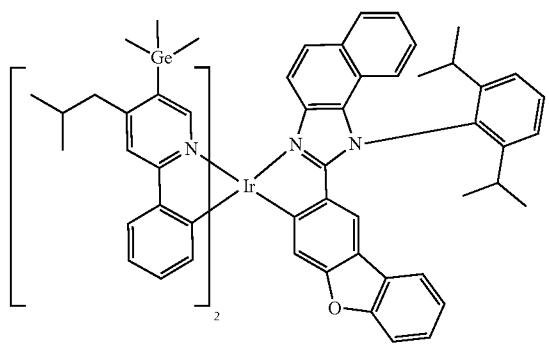
3096
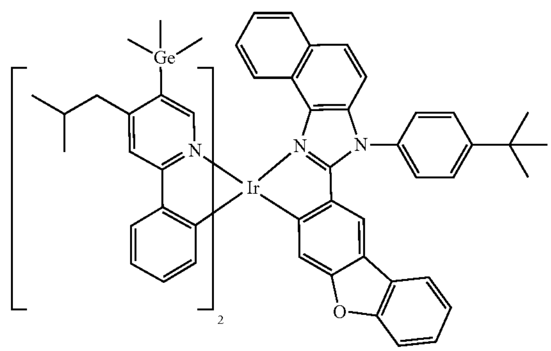
3097
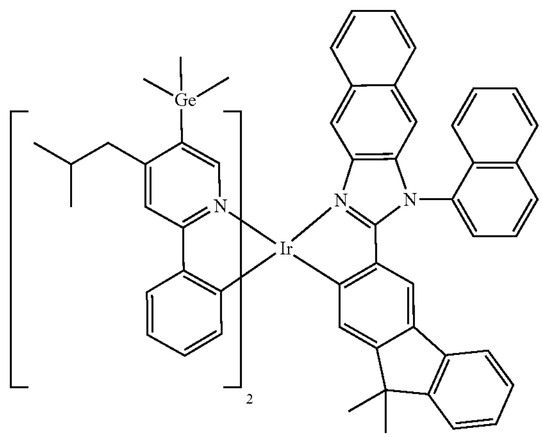
3098
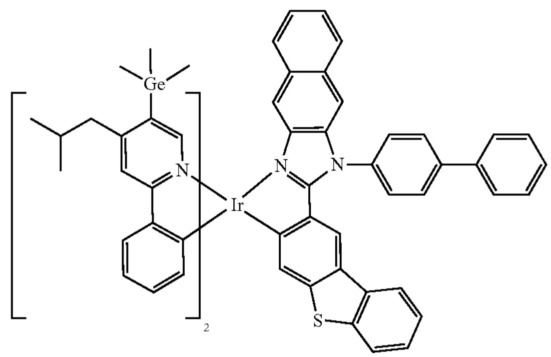

-continued
3099
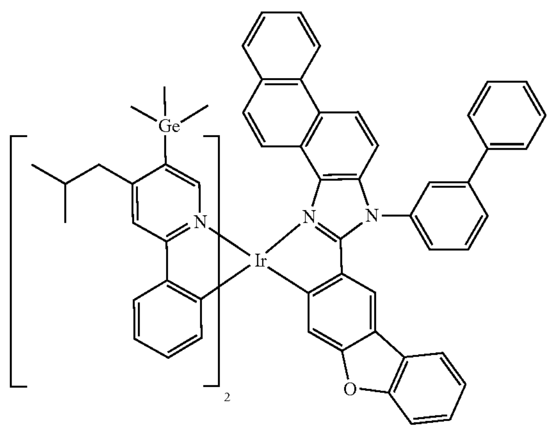
3100
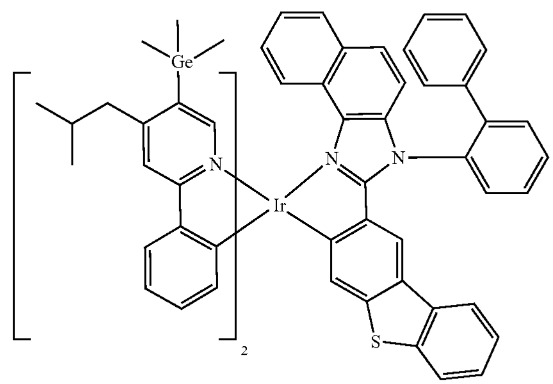
3101
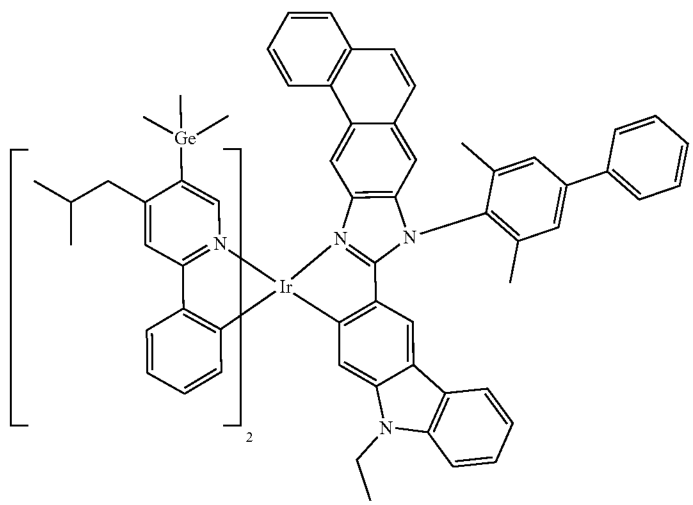
3102
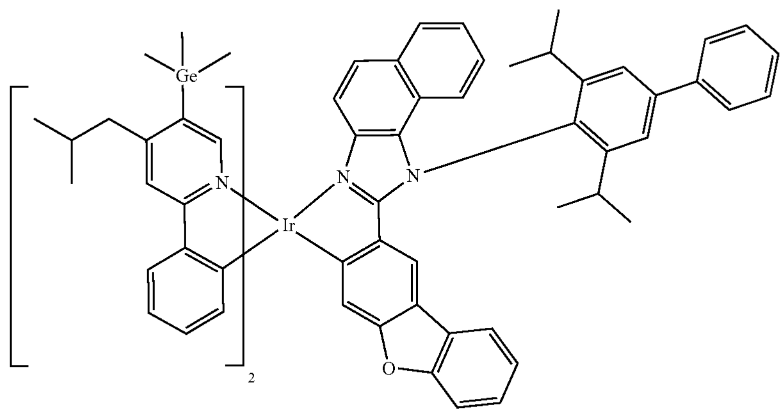

-continued
3103
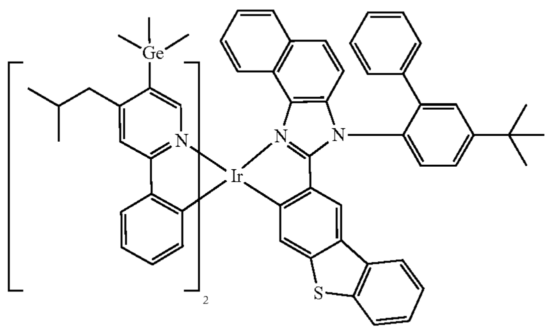
3104
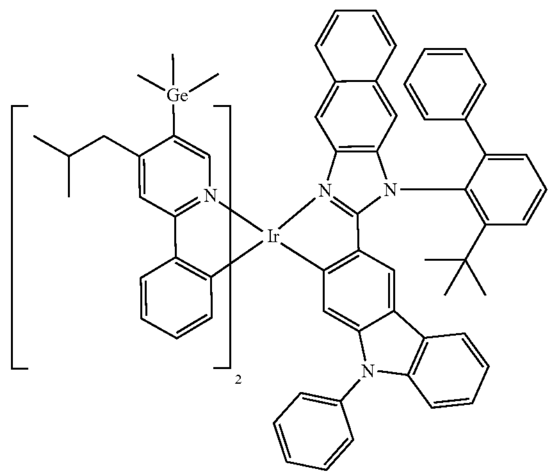
3105
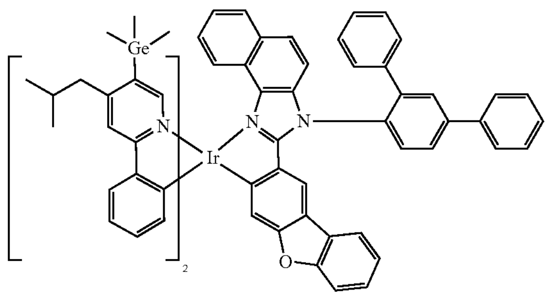
3106
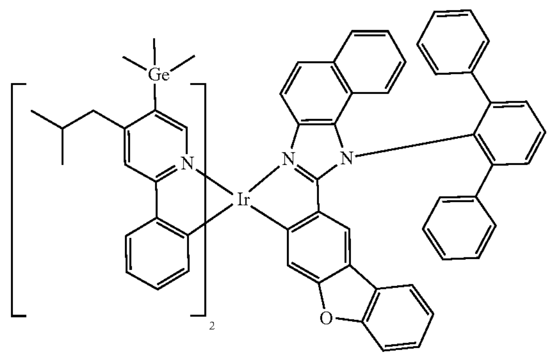
3107
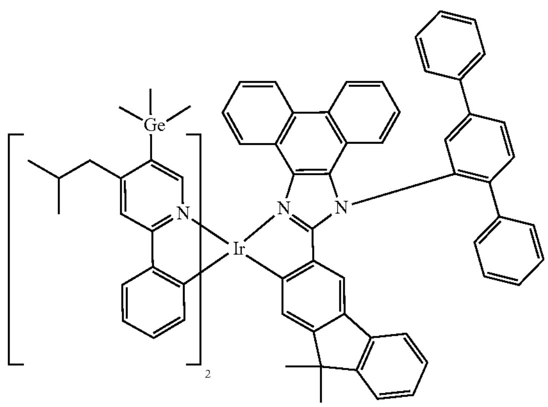
3108
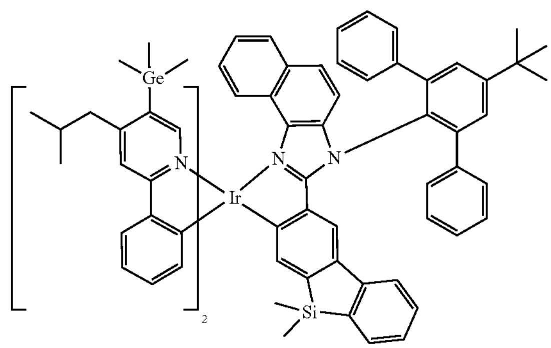

-continued
3109
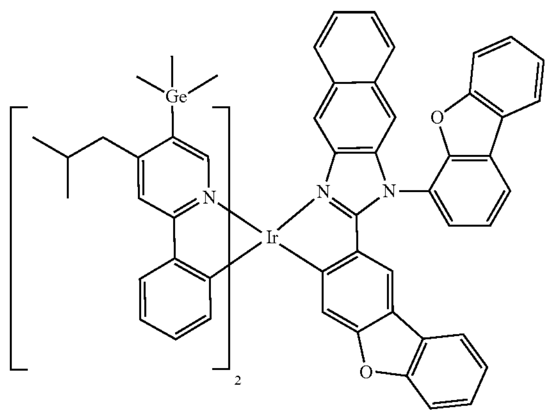
3010
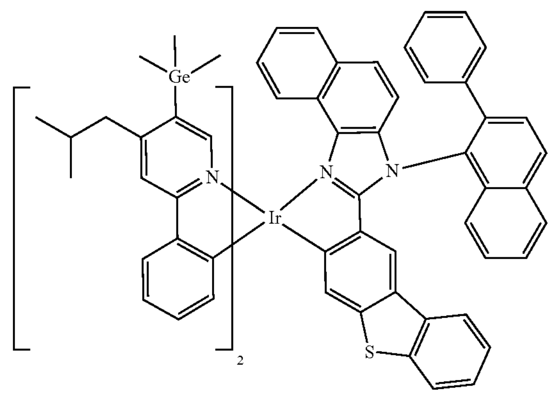
3011
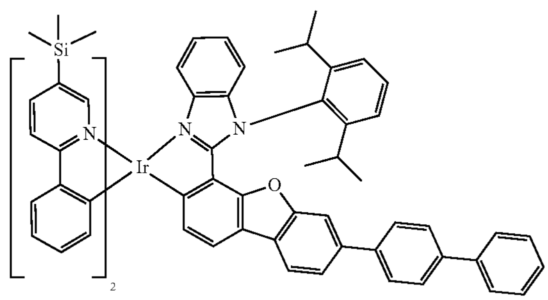
3012
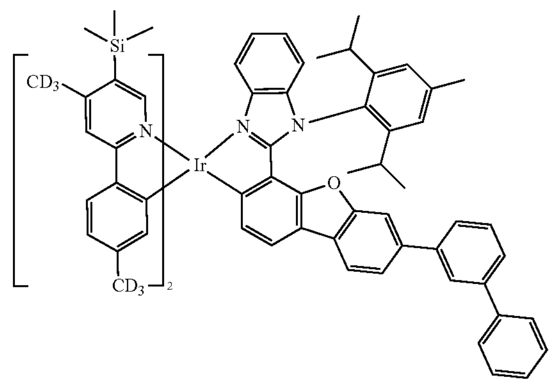
3113
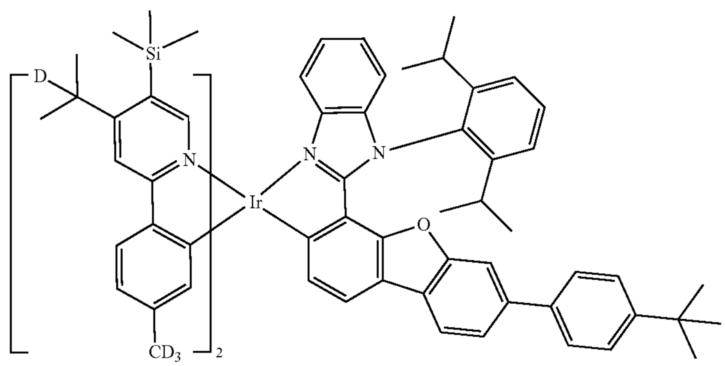
3114
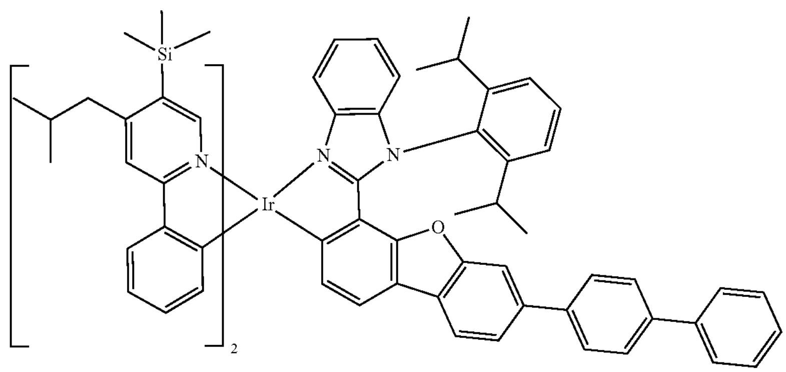

-continued
3115
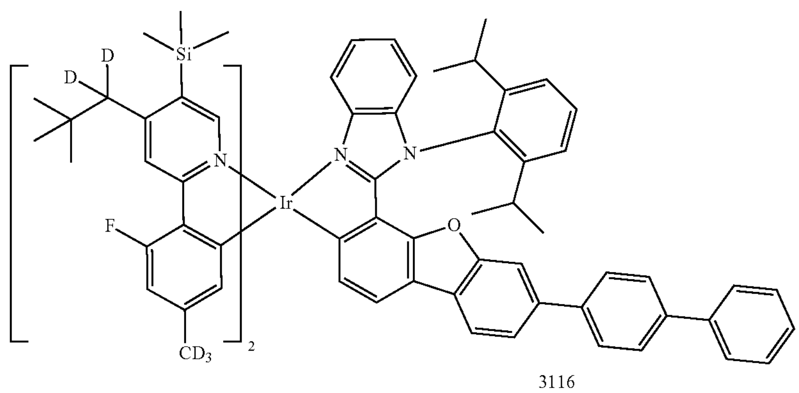
3116
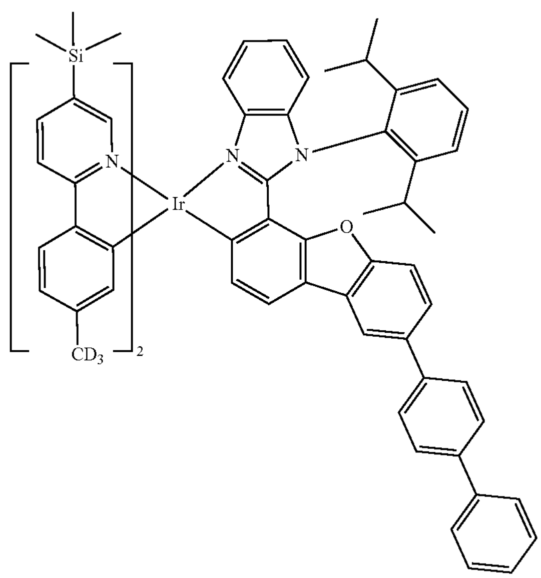
3117
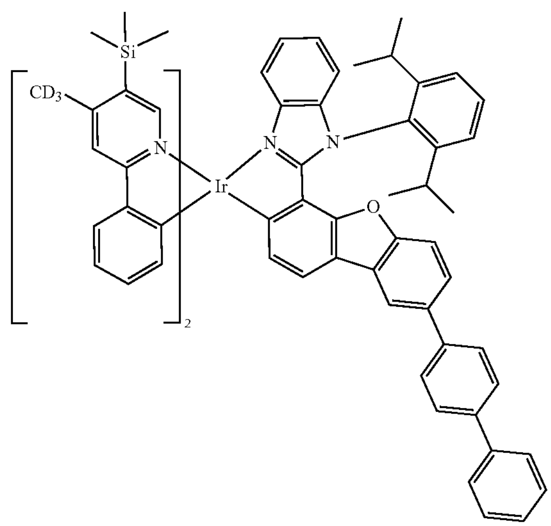
3118
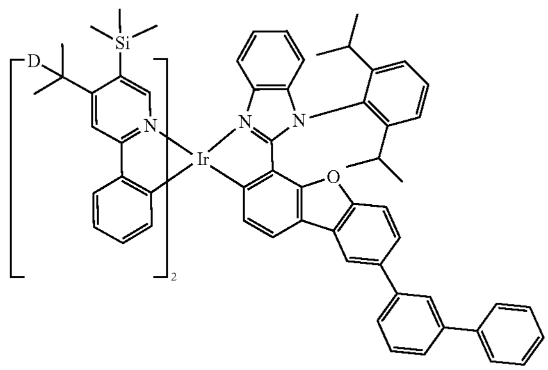
3119
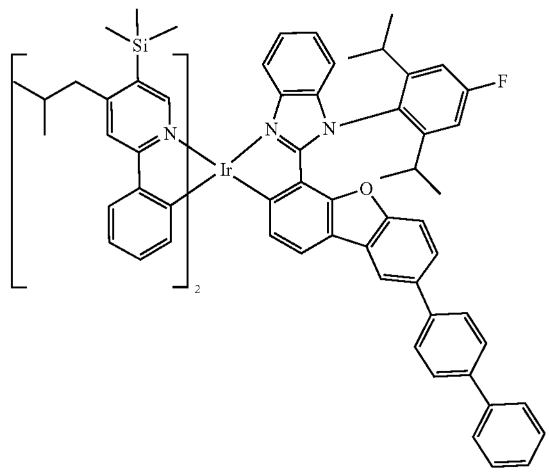

-continued
3120
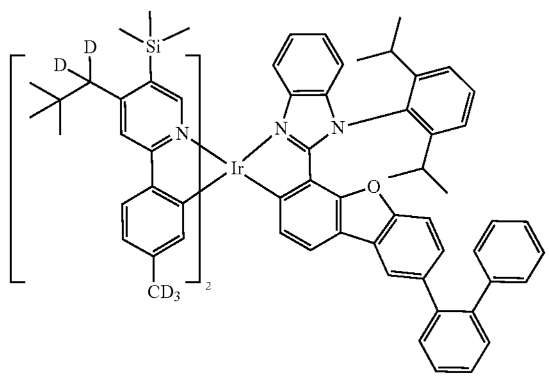
3121
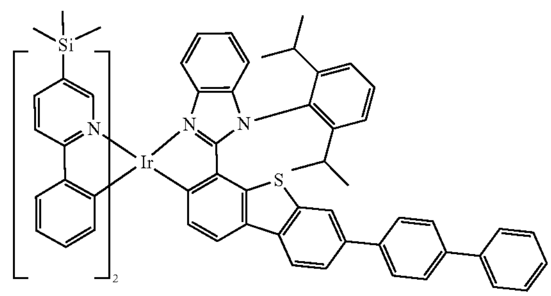
3122
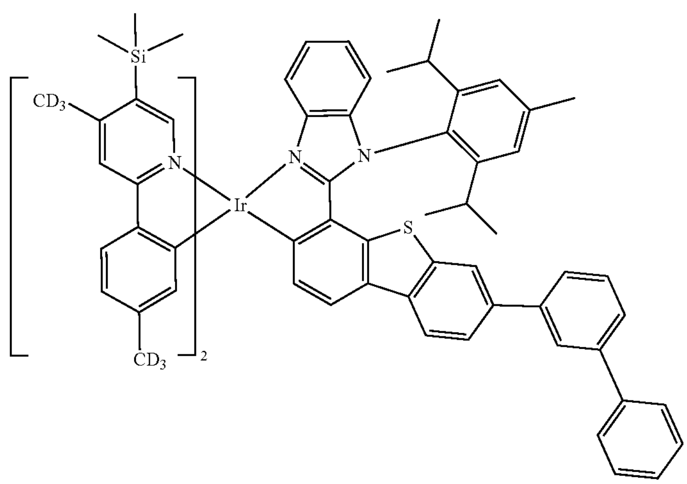
3123
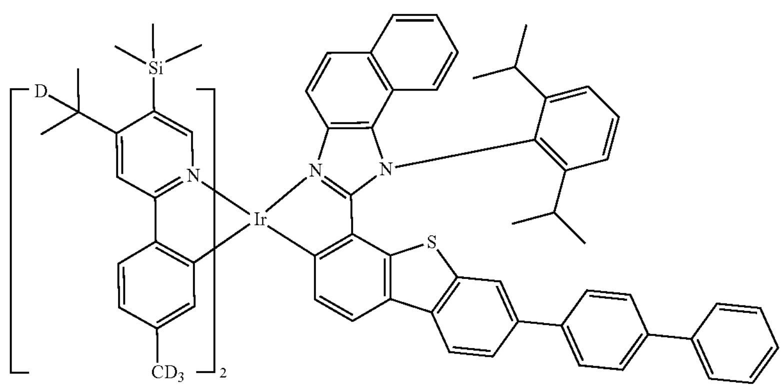
3124
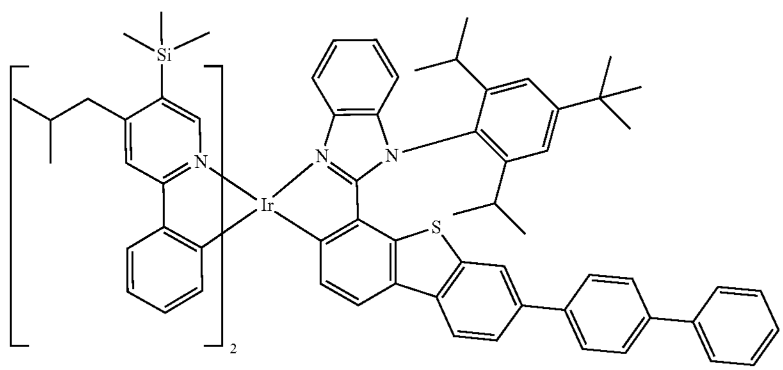

-continued
3125
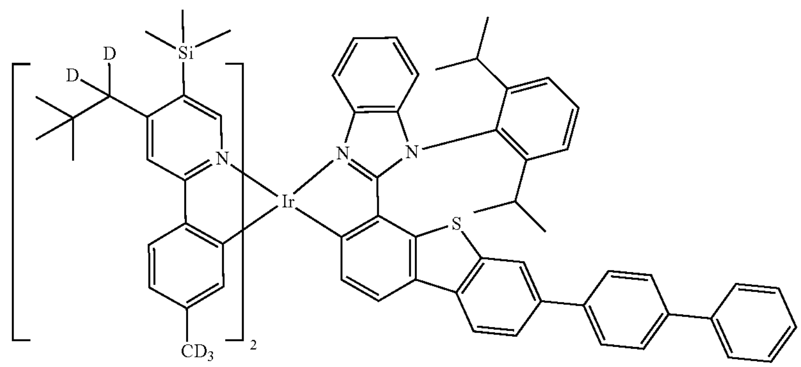
3126
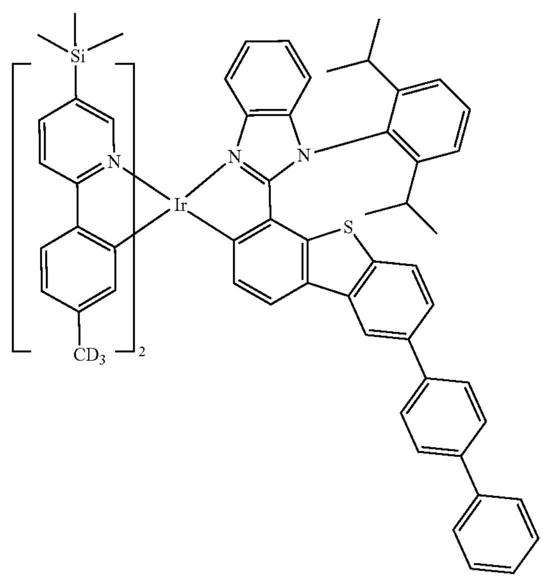
3127
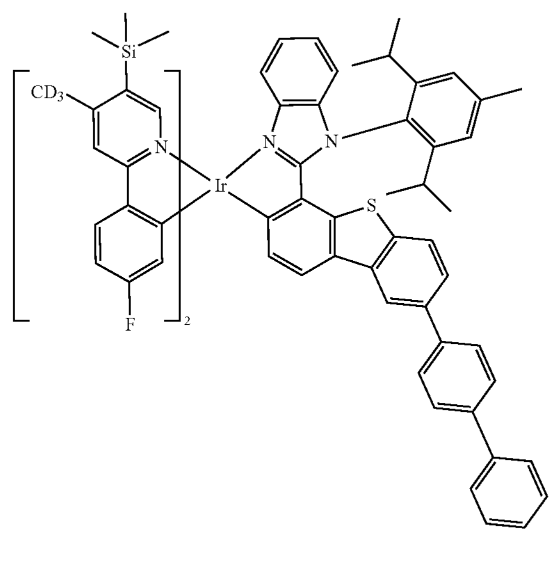
3128
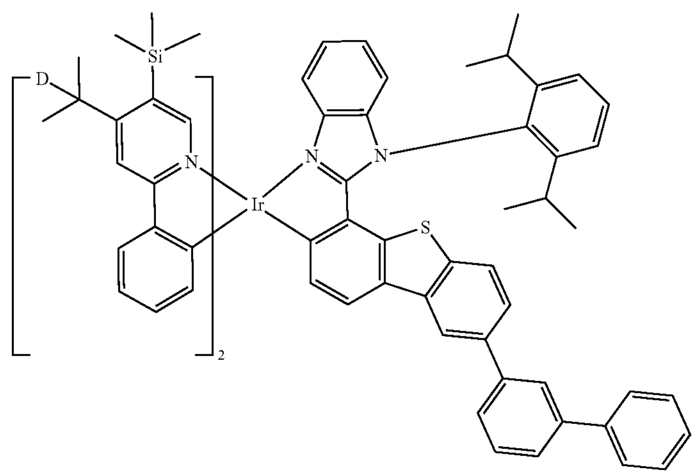

-continued
3129
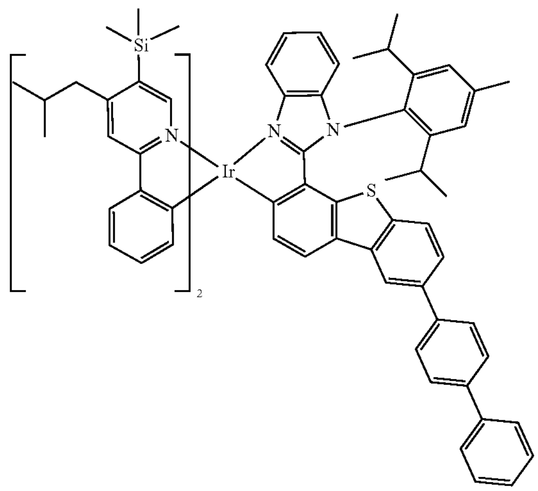
3130
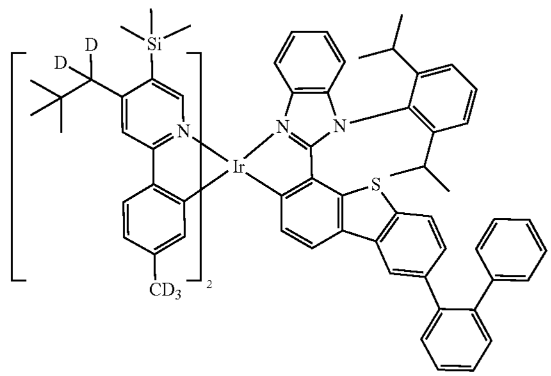
3131
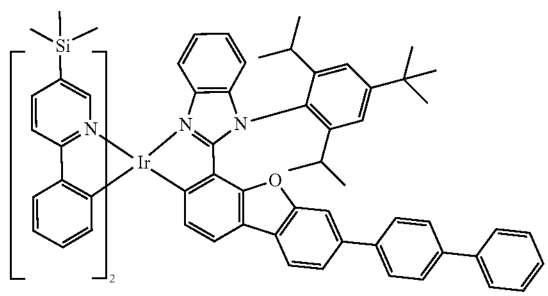
3132
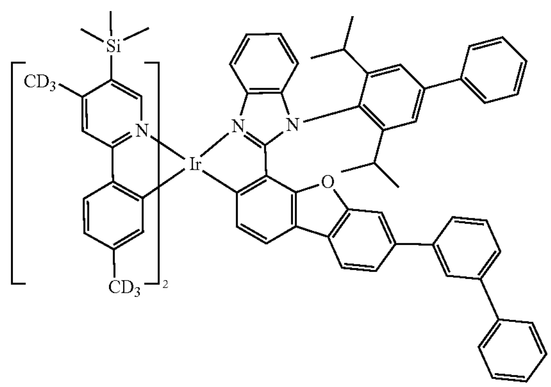
3133
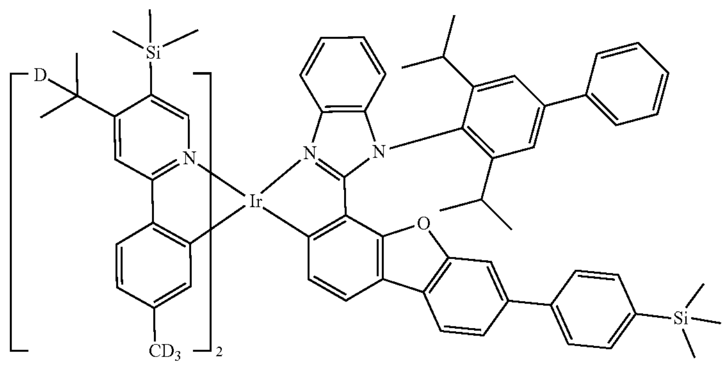

-continued
3134
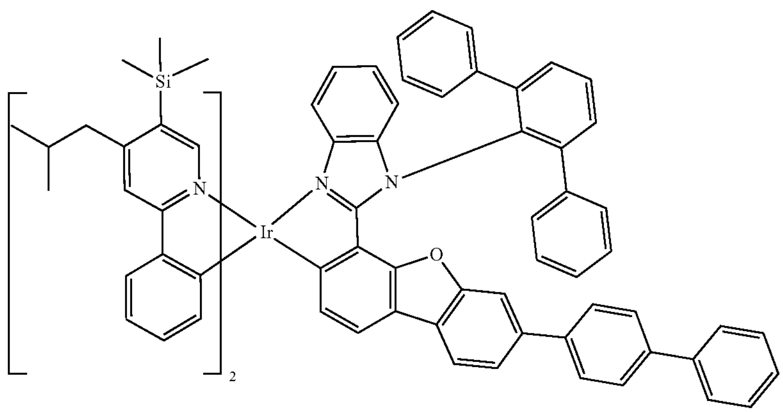
3135
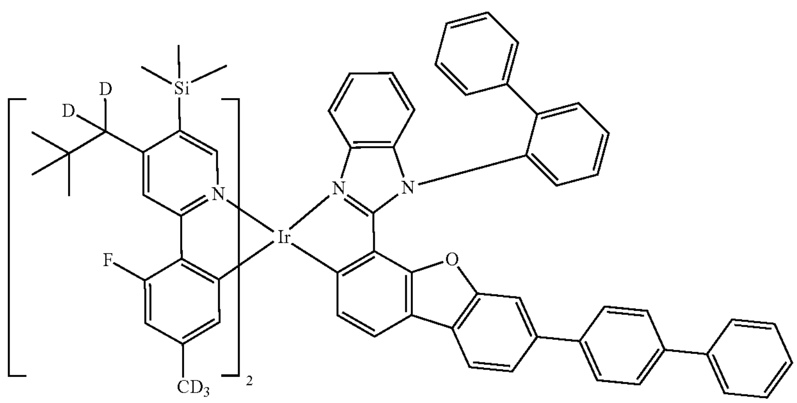
3136
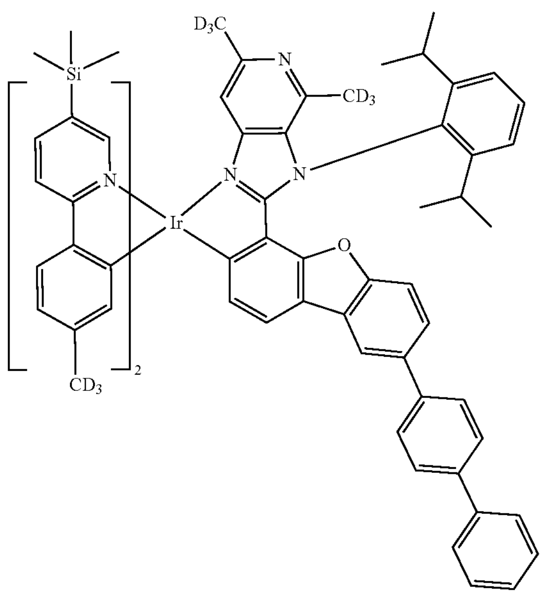
3137
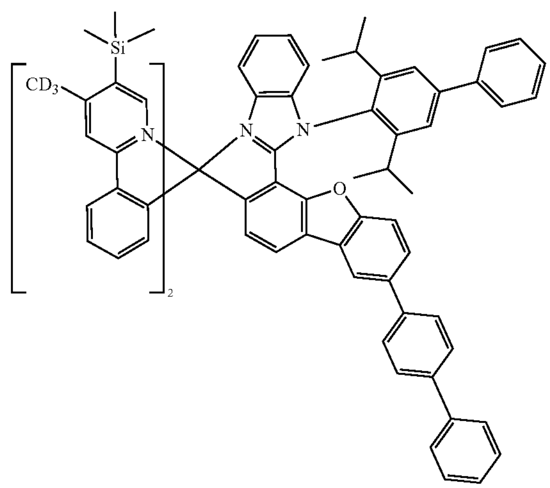

-continued
3138
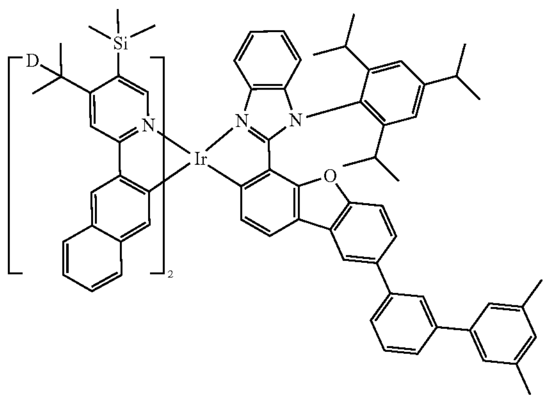
3139
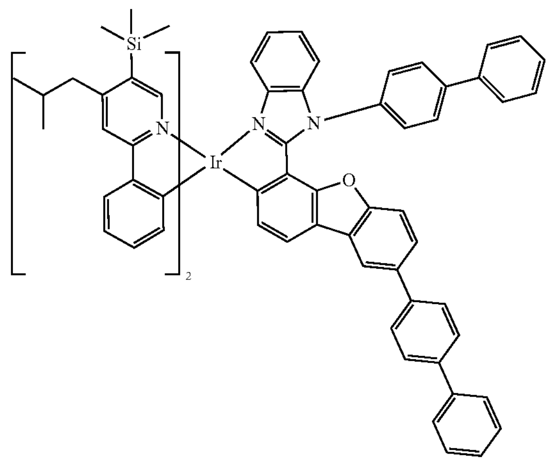
3140
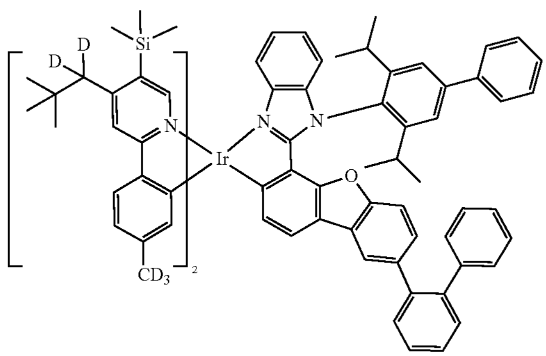
3141
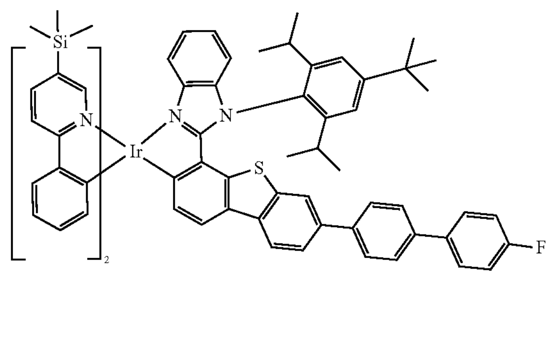
3142
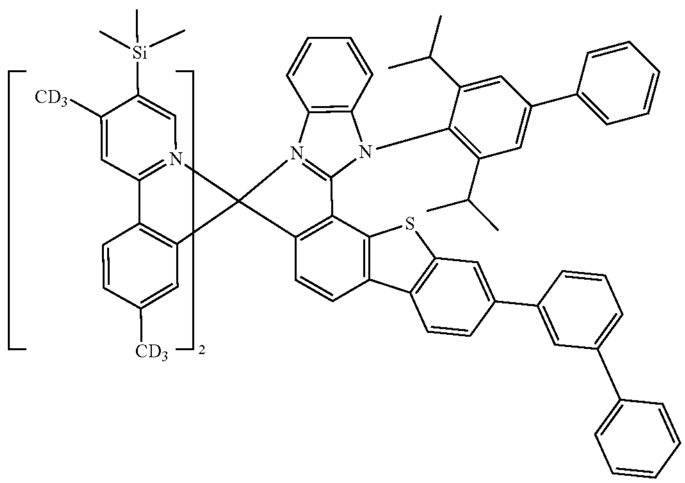

-continued
3143
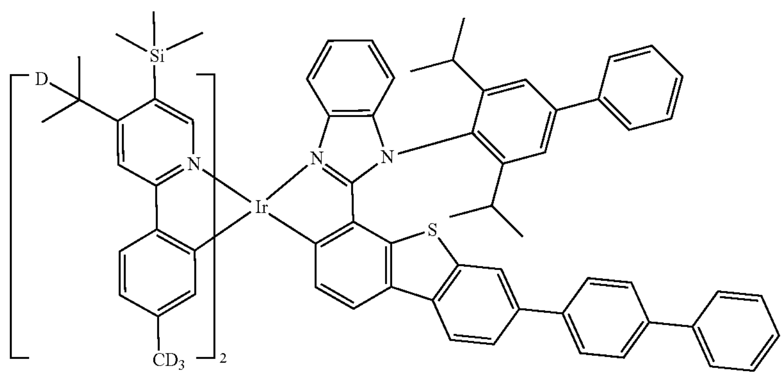
3144
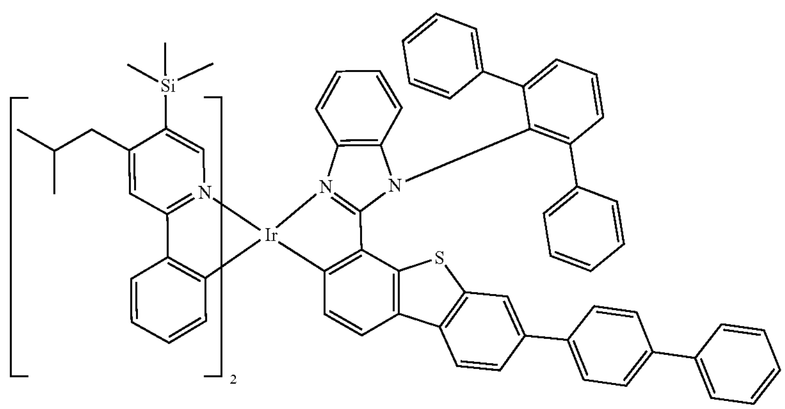
3145
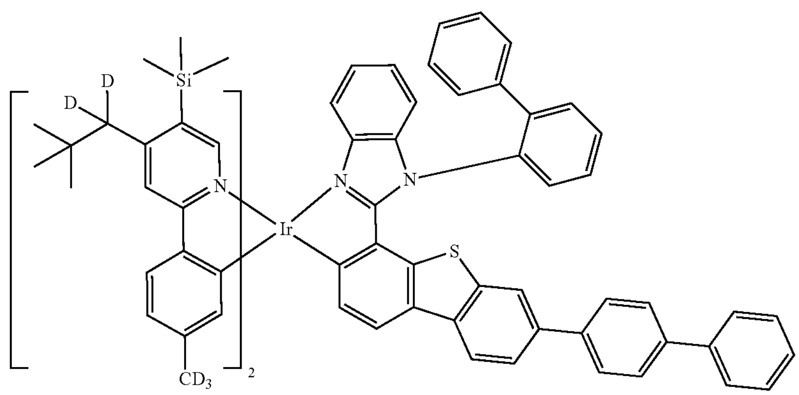

-continued
3146
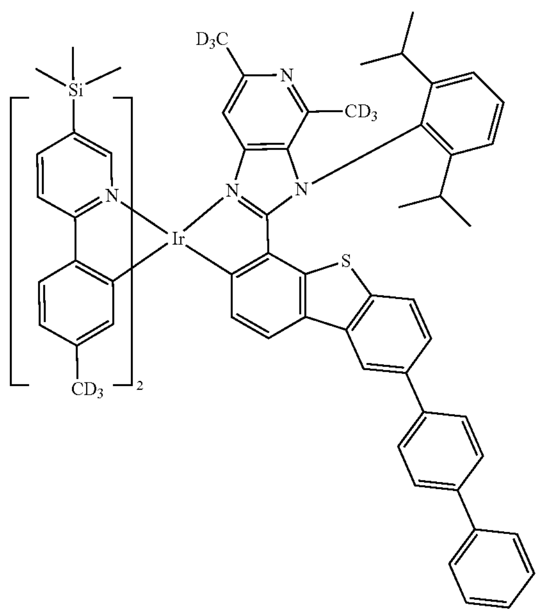
3147
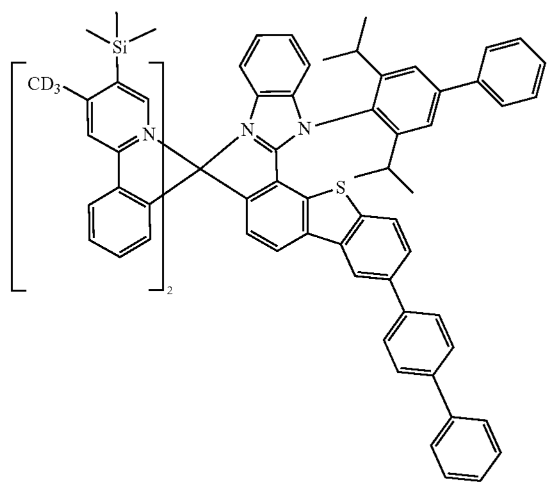
3148
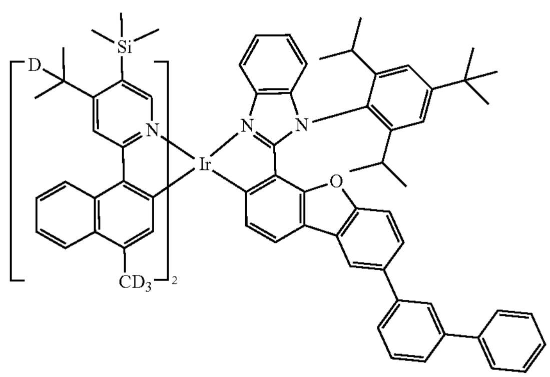
3149
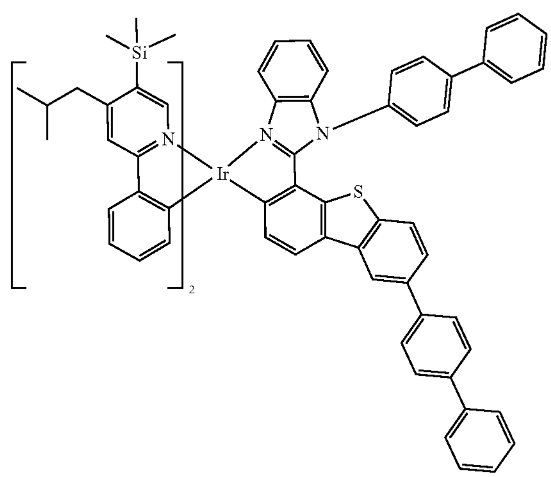
3150
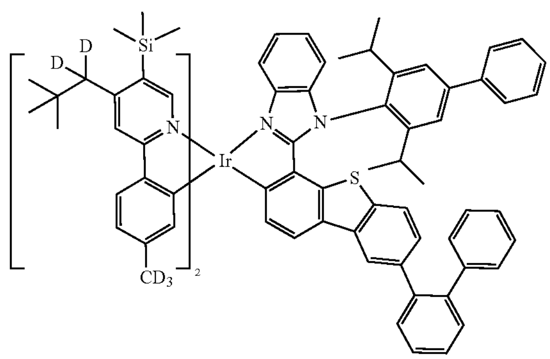
3151
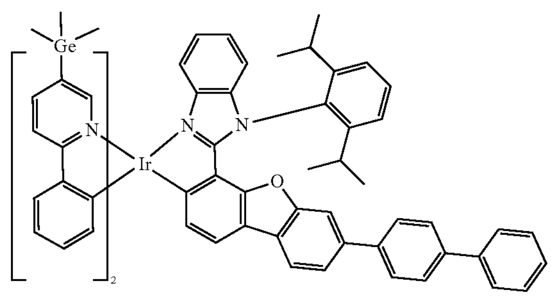

-continued
3152
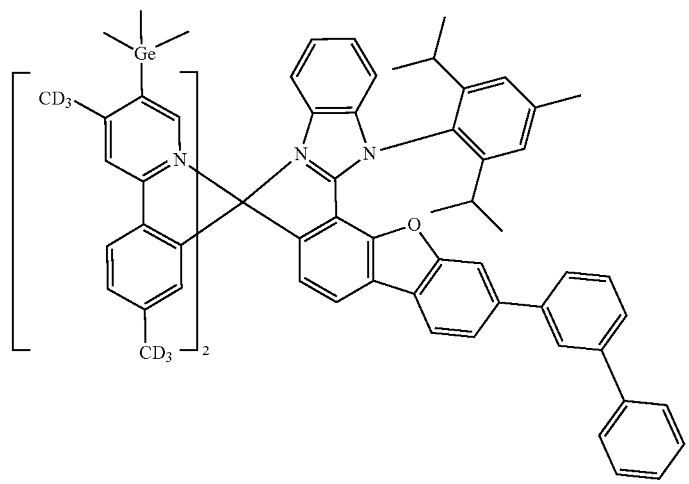
3153
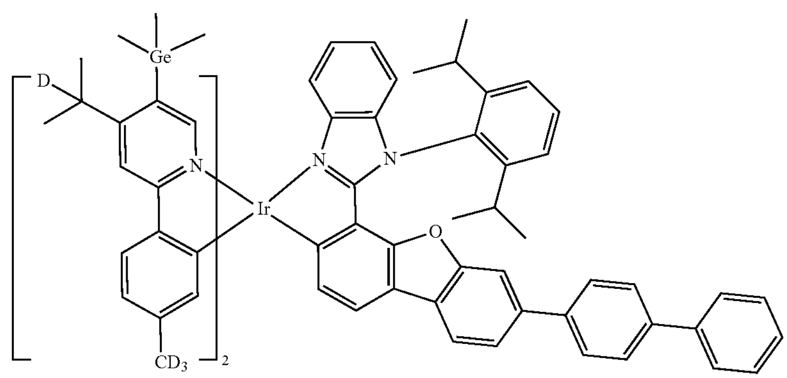
3154
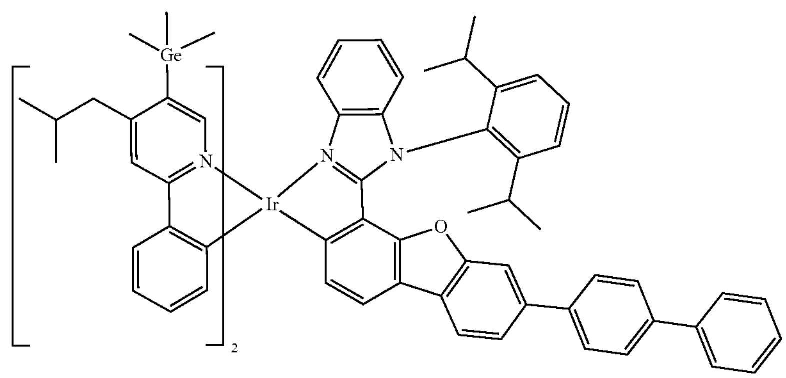
3155
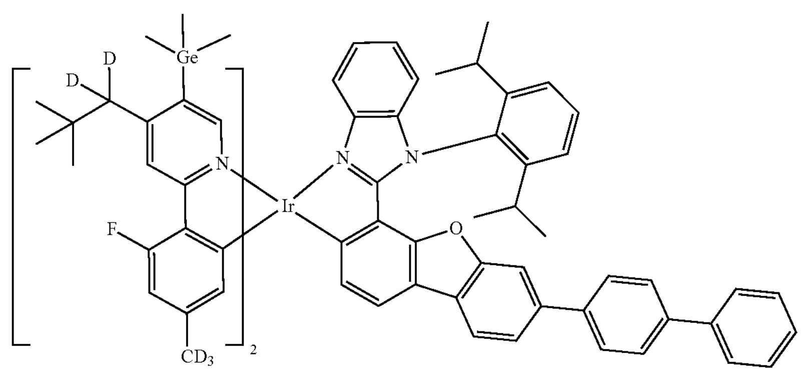

-continued
3156
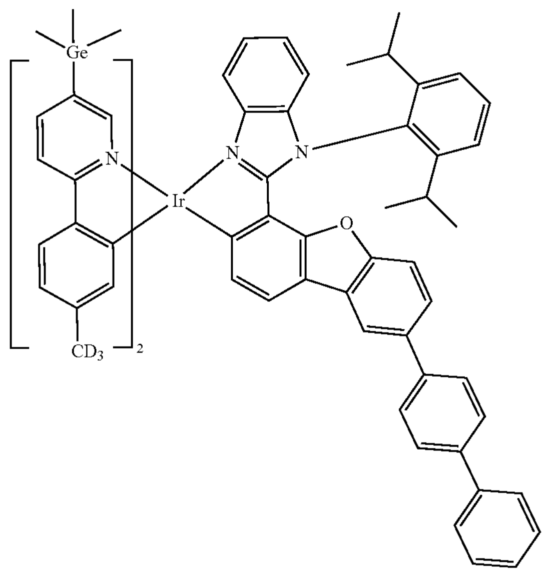
3157
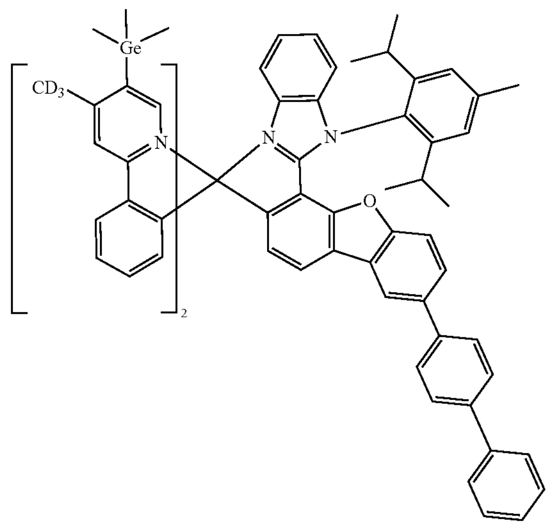
3158
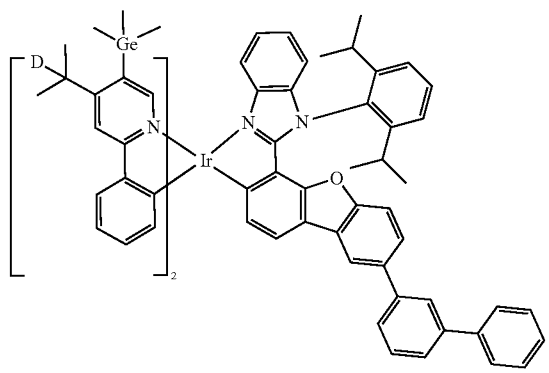
3159
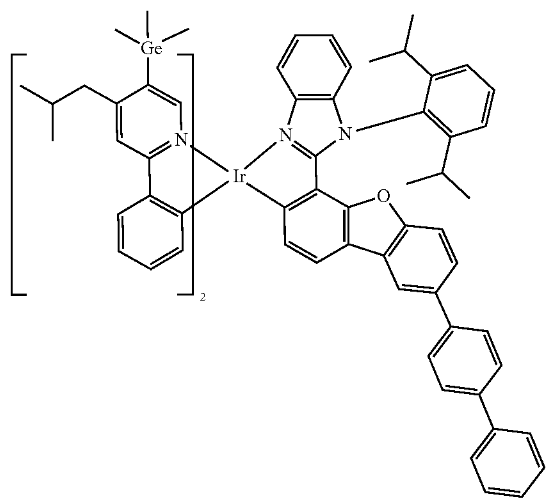
3160
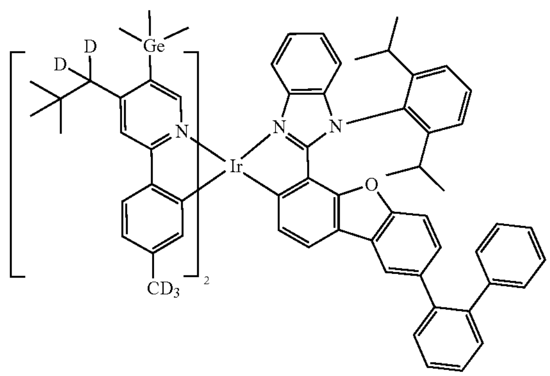
3161
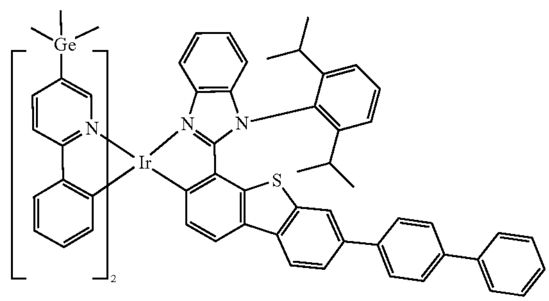

-continued
3162
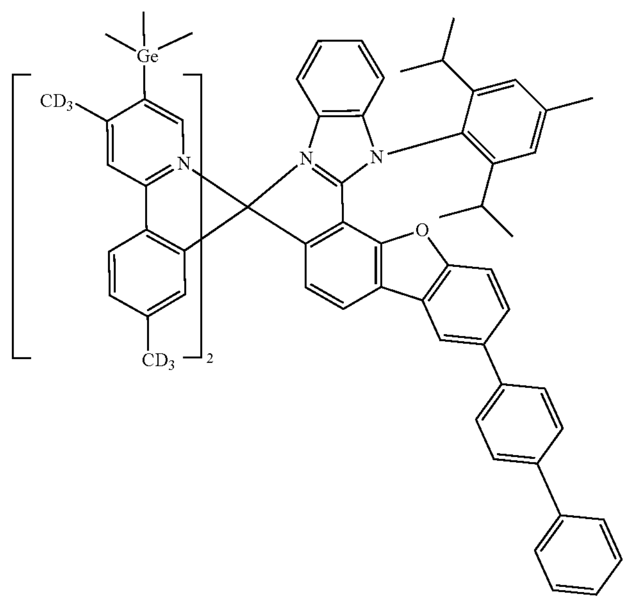
3163
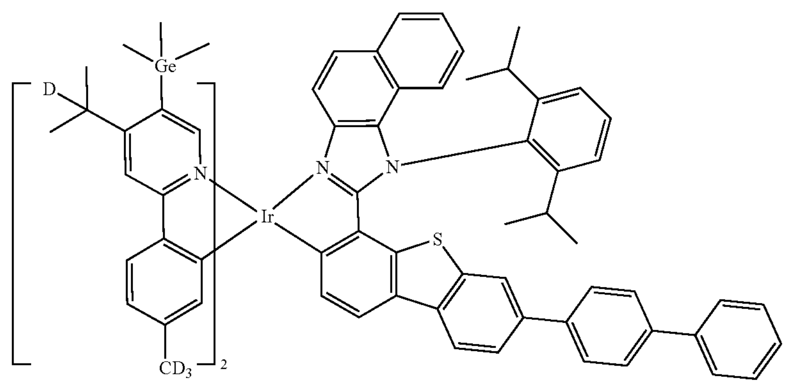
3164
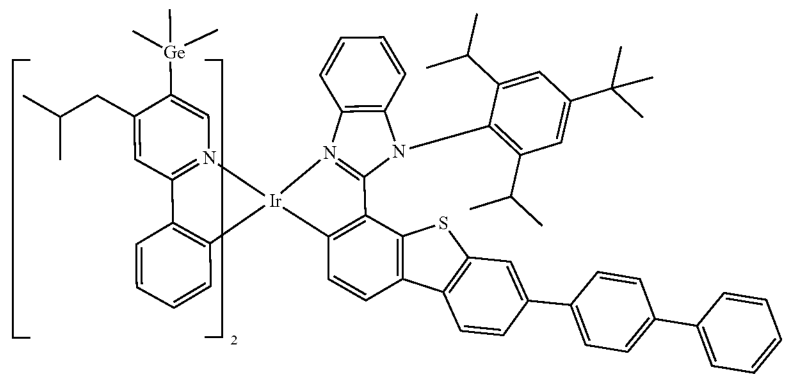

-continued
3165
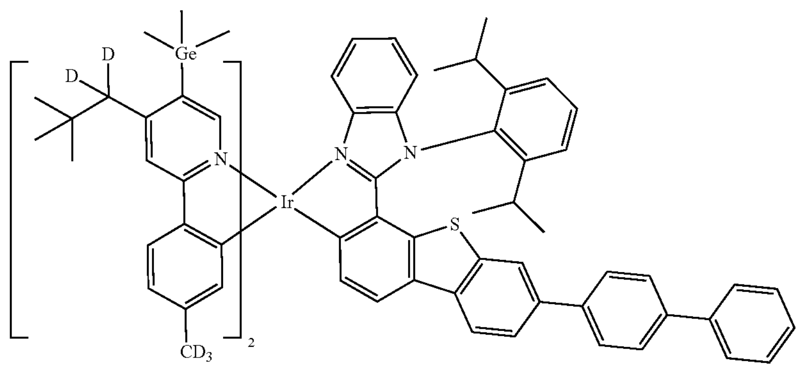
3166
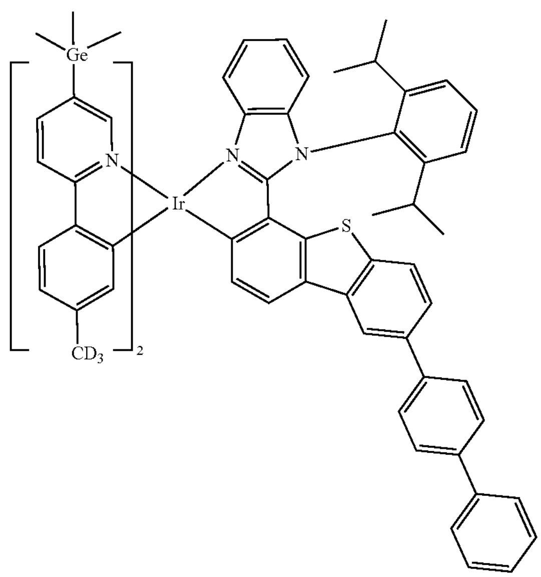
3167
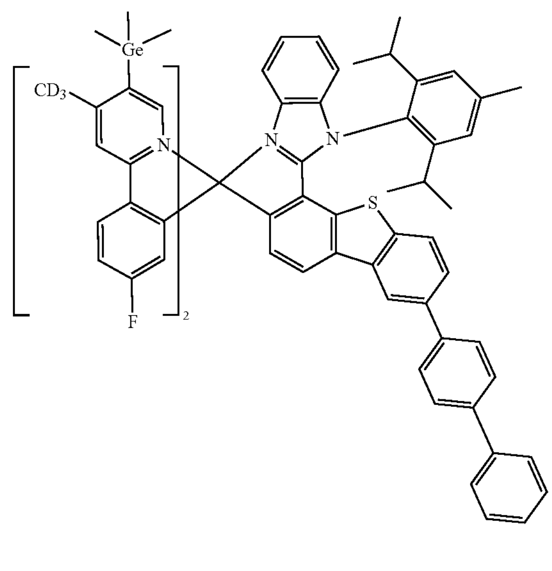
3168
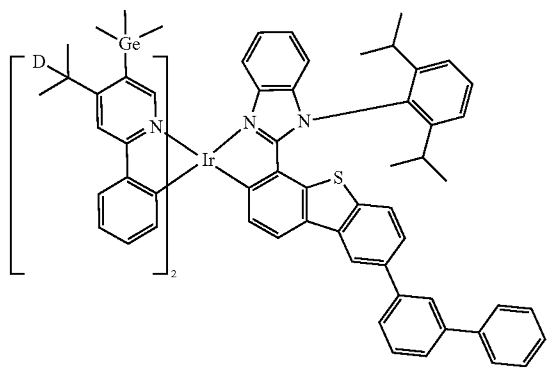
3169
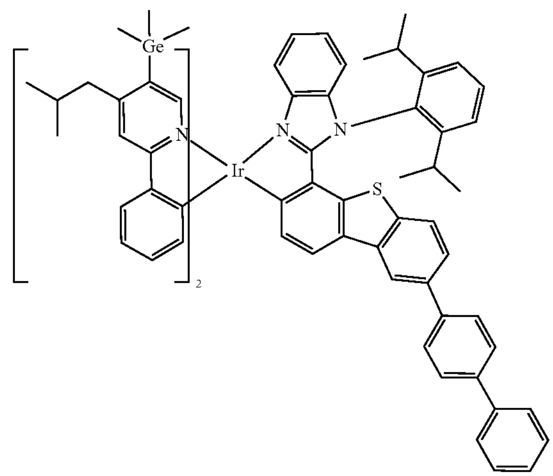

-continued
3170
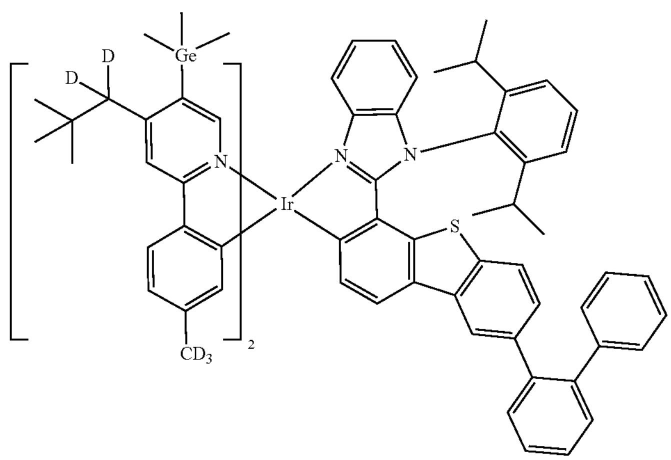
3171
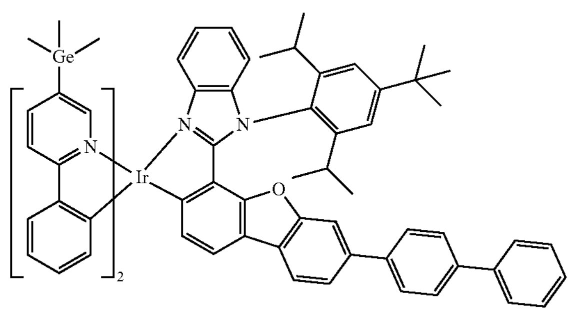
3172
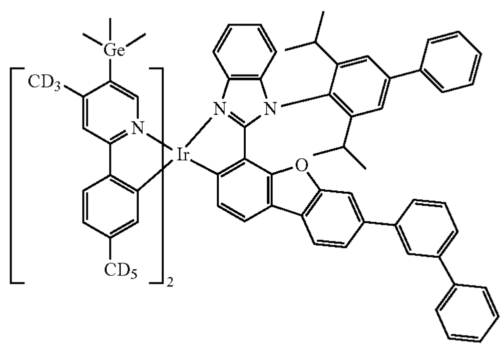
3173
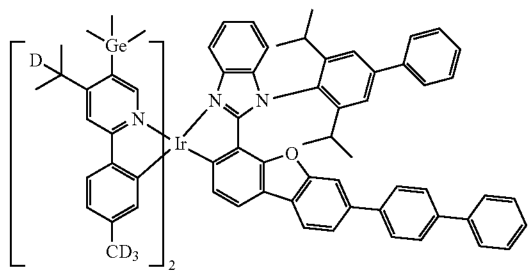
-continued
3174
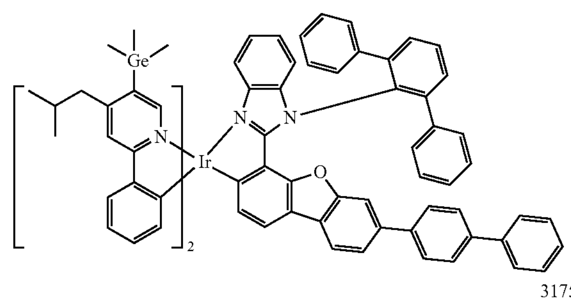
3175
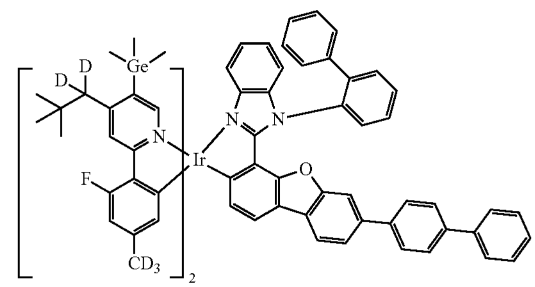
3176
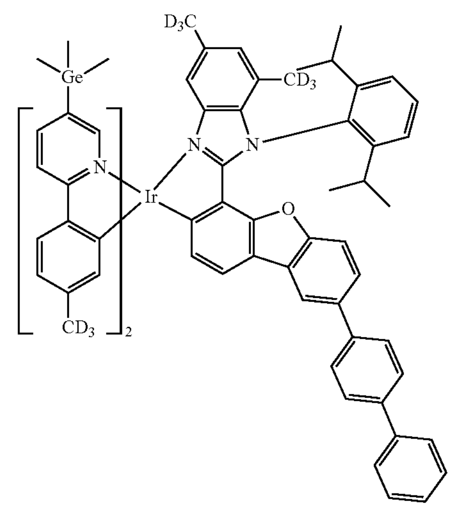

-continued
3177
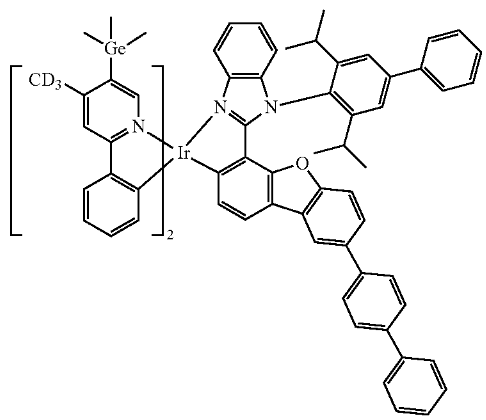
3178
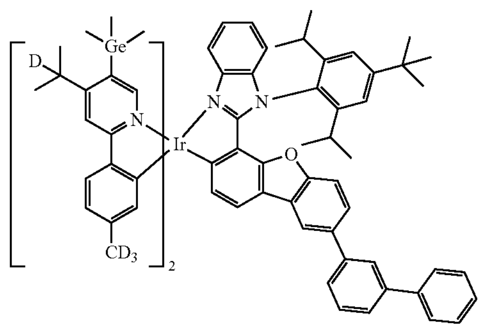
3179
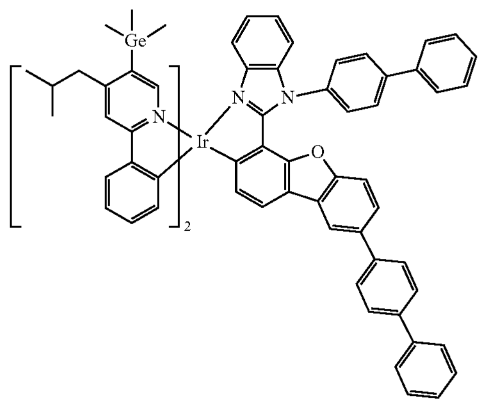
3180
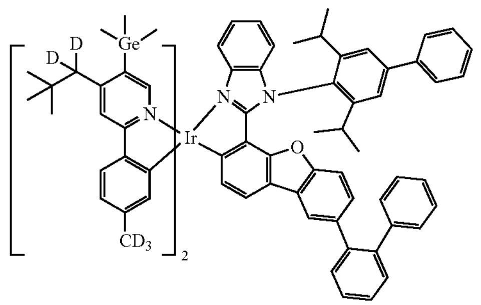
-continued
3181
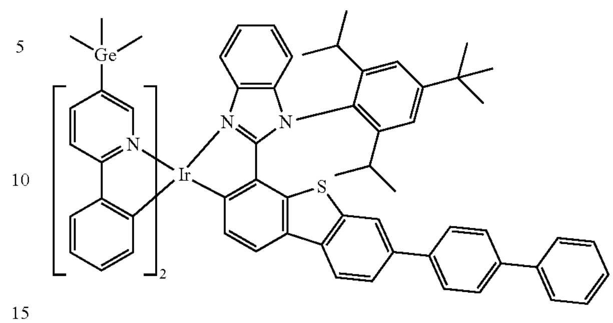
3182
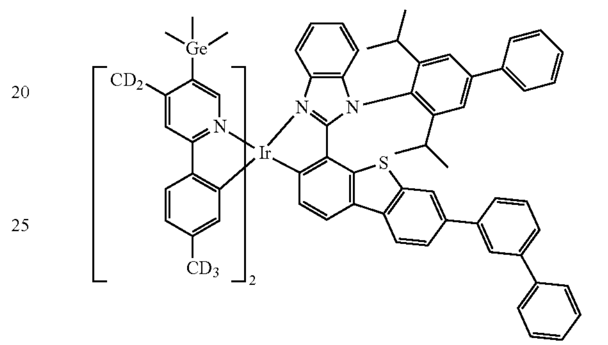
3183
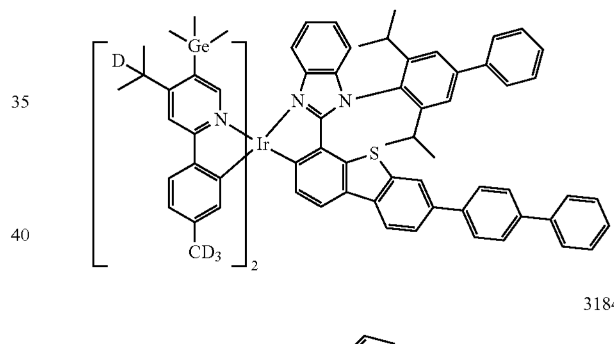
3184
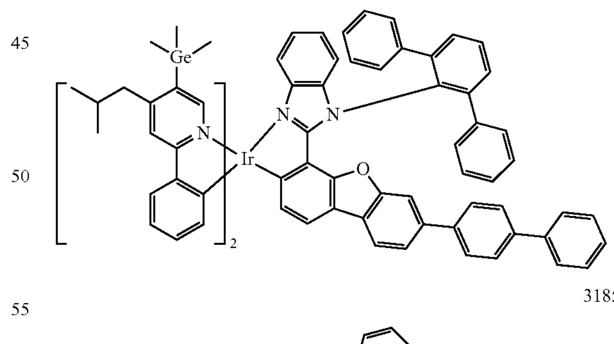
3185
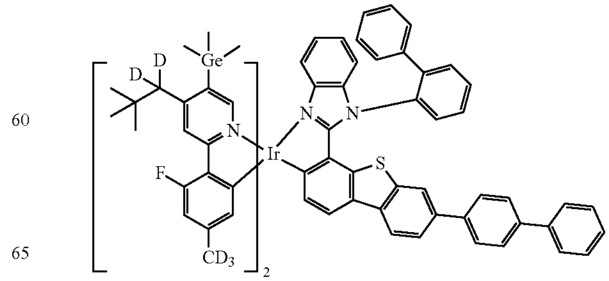

-continued
3186
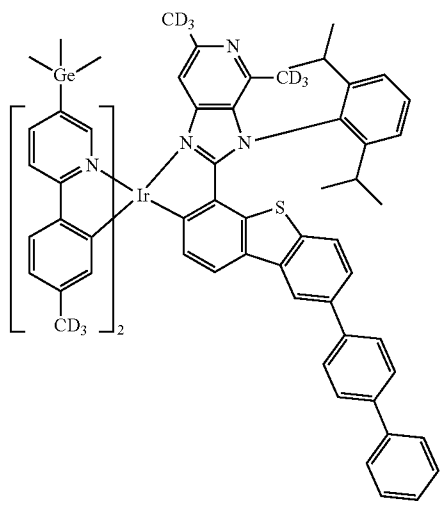
3187
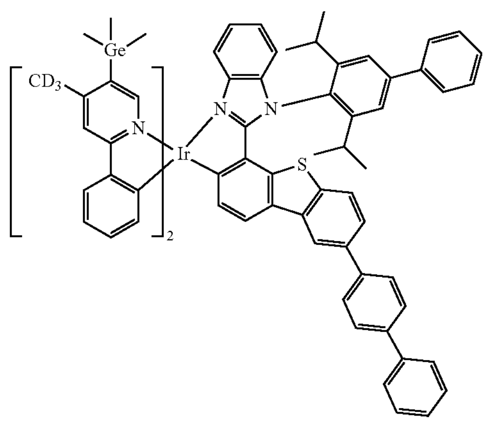
3188
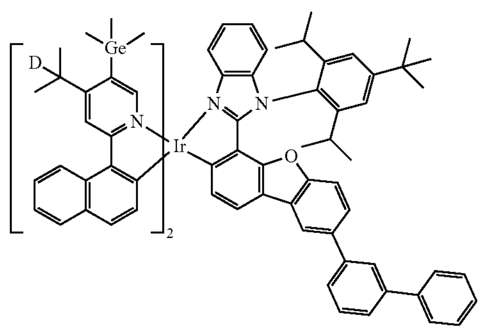
-continued
3189
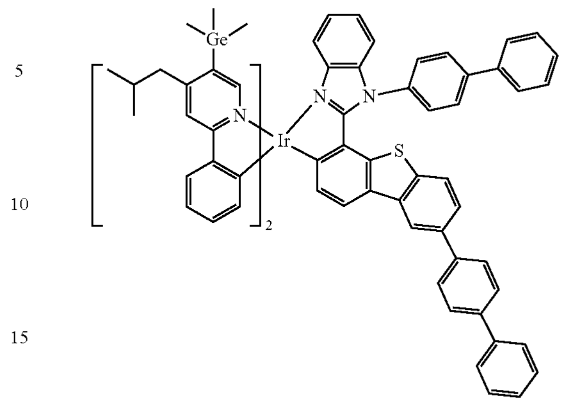
3190
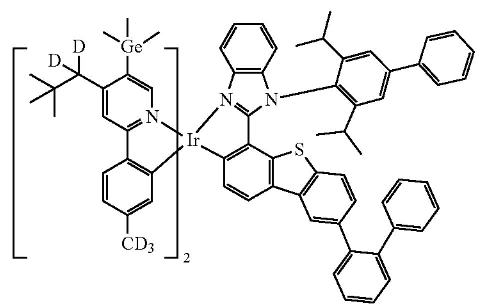
3191
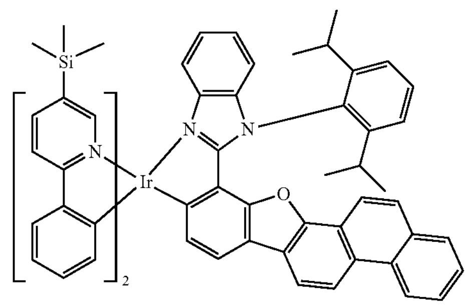
3192
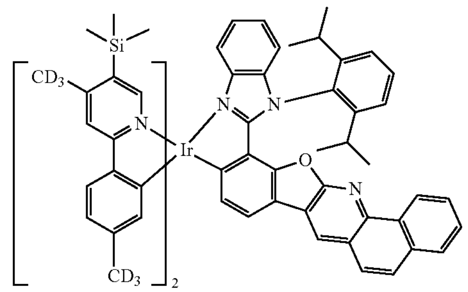
3193
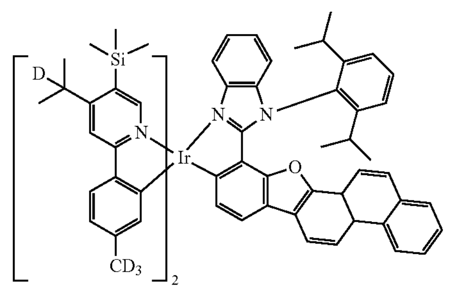

-continued
3194
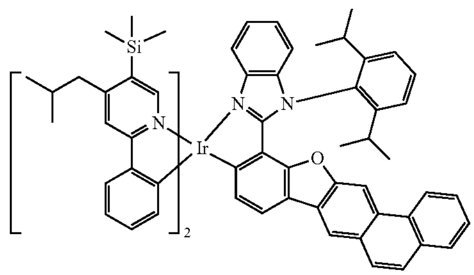
3195
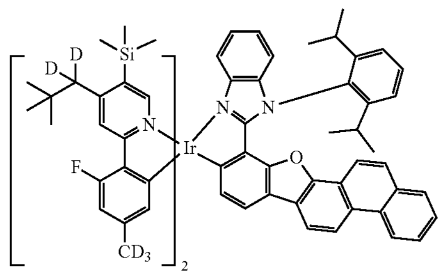
3196
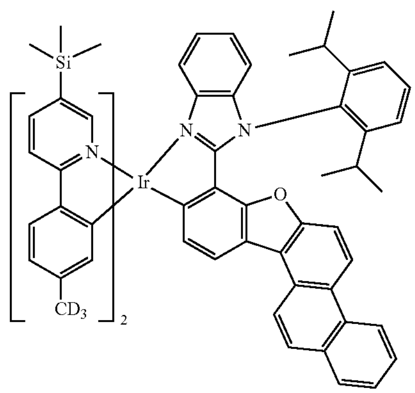
3197
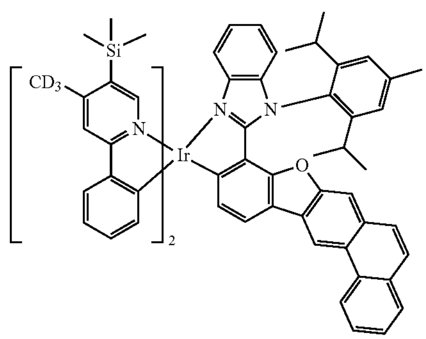
3198
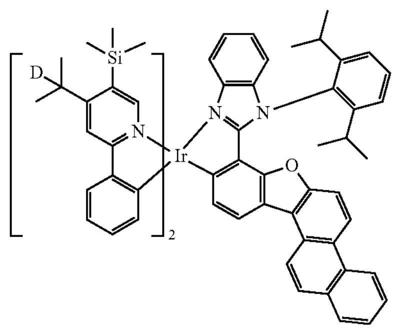
-continued
3199
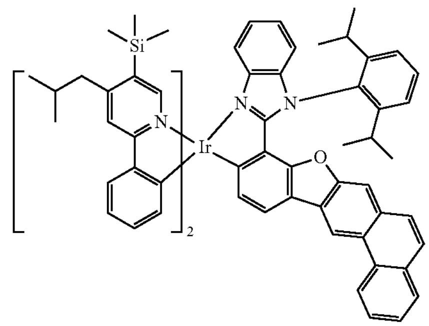
3200
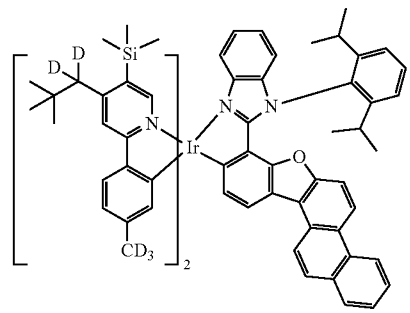
3201
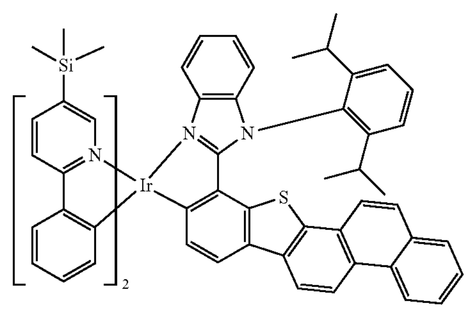
3202
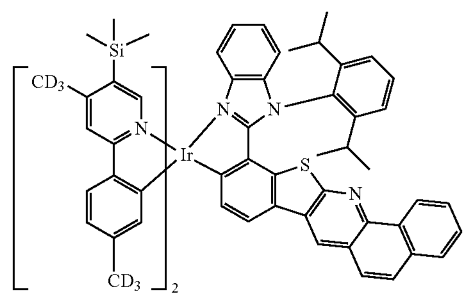
3203
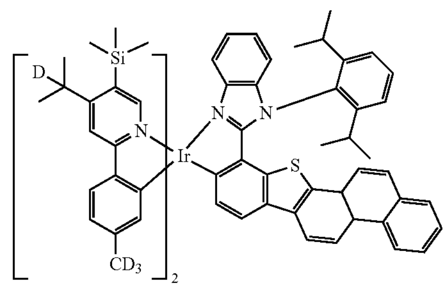

-continued
3204
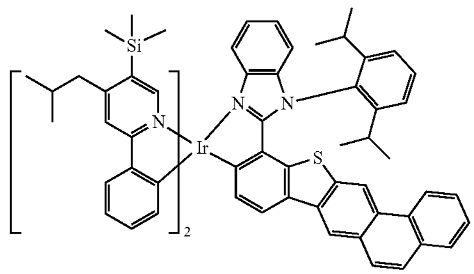
3205
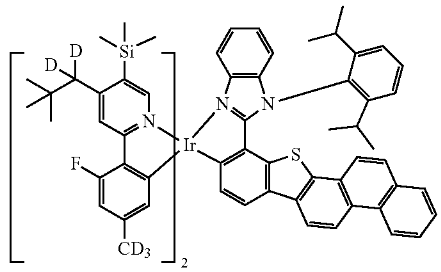
3206
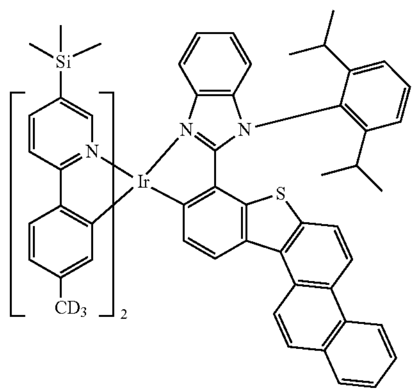
3207
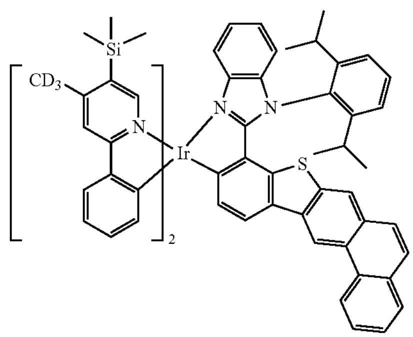
3208
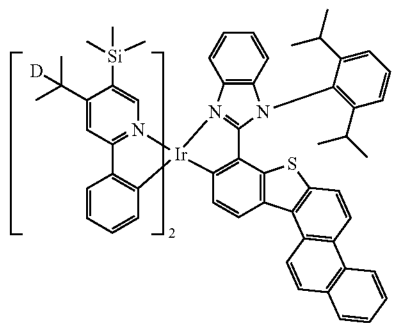
-continued
3209
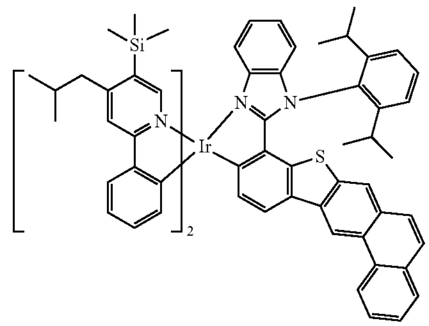
3210
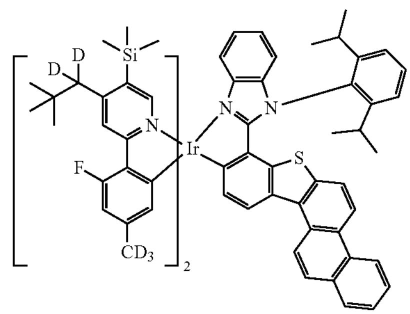
3211
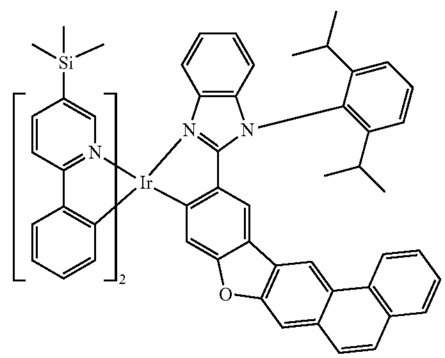
3212
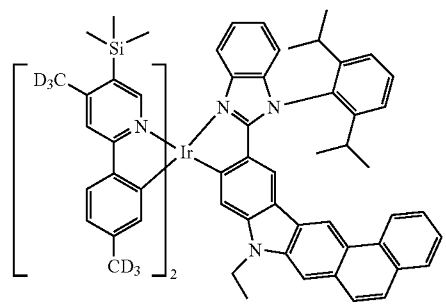
3213
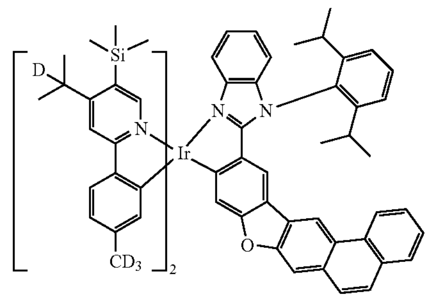

-continued
3214
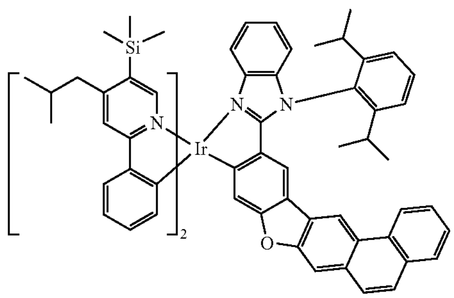
3215
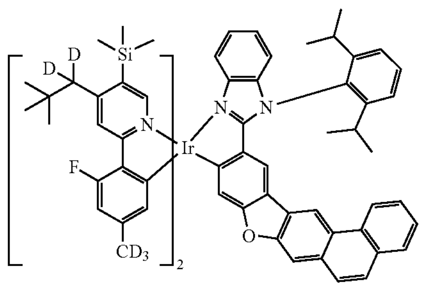
3216
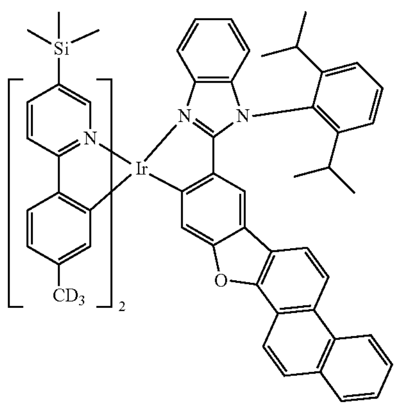
3217
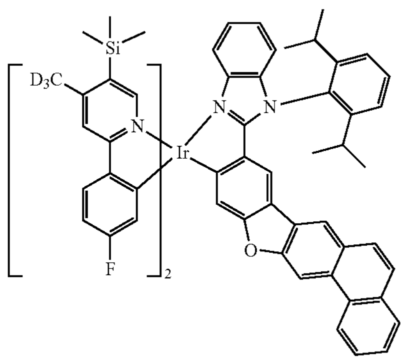
-continued
3218
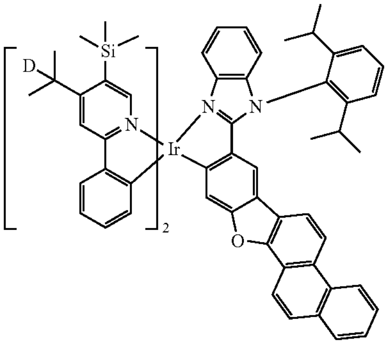
3219
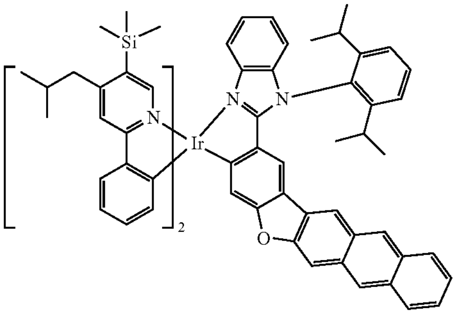
3220
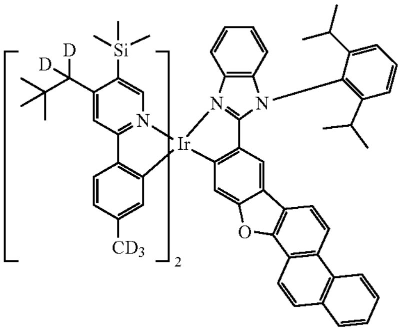
3221
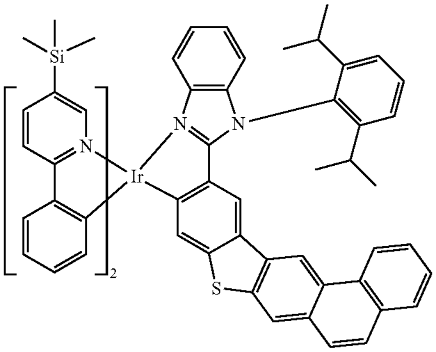

-continued
3222
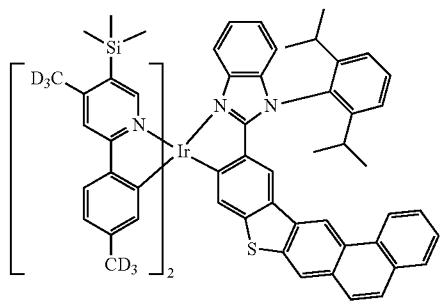
3223
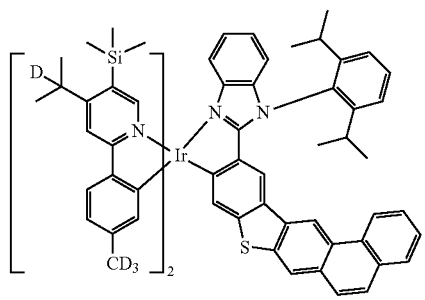
3224
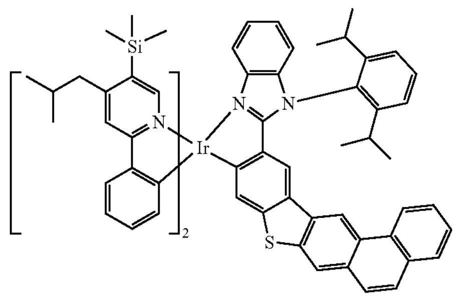
3225
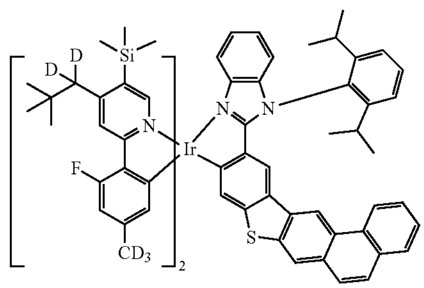
3226
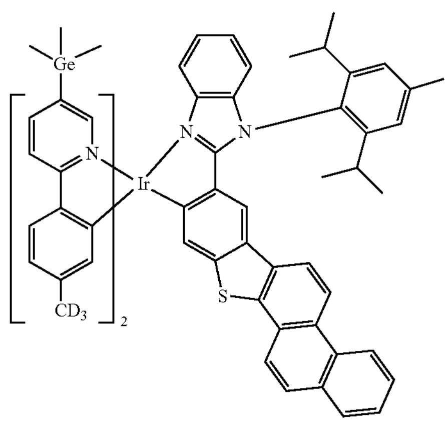
-continued
3227
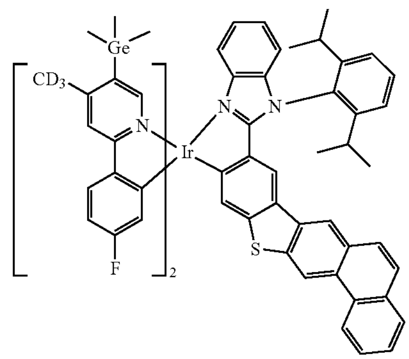
3228
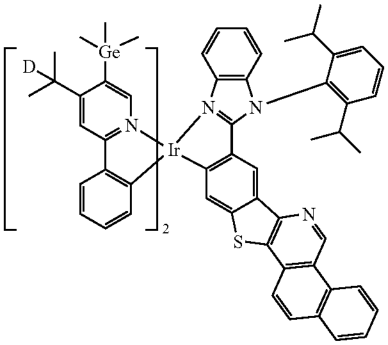
3229
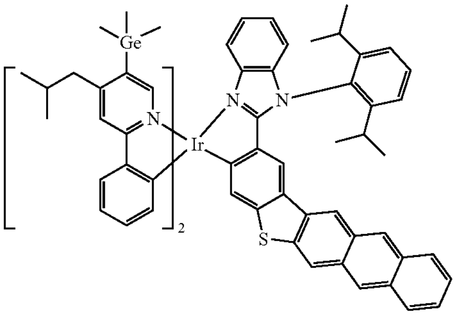
3230
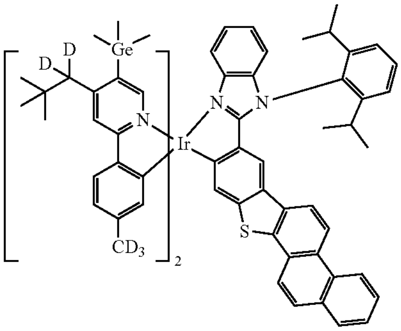

-continued
3231
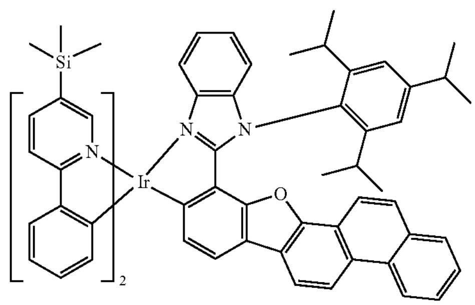
3232
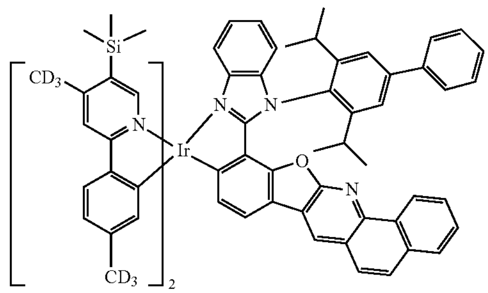
3233
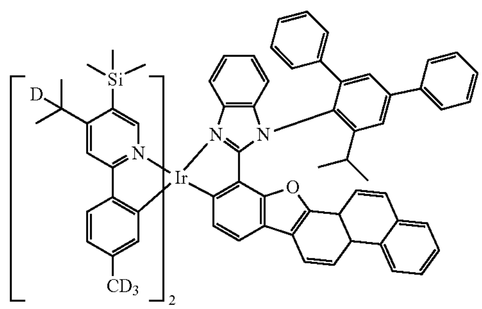
3234
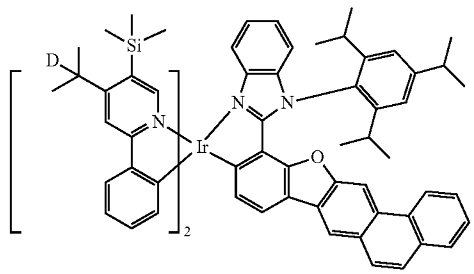
3235
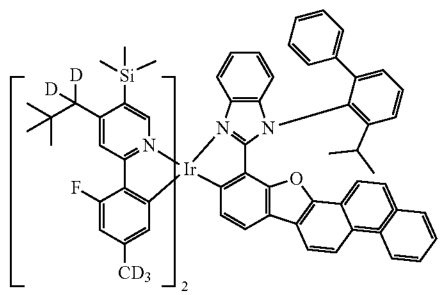
-continued
3236
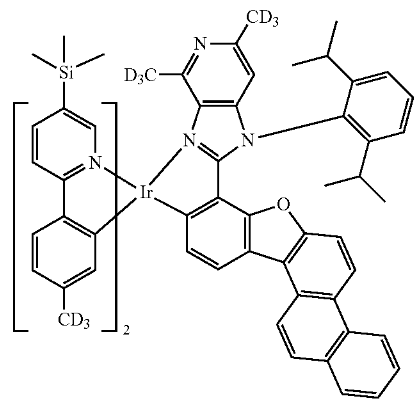
3237
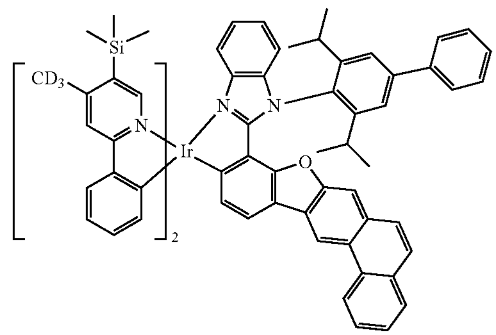
3238
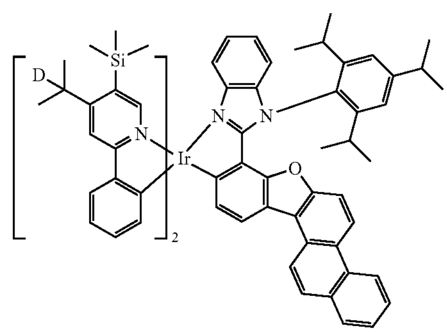
3239
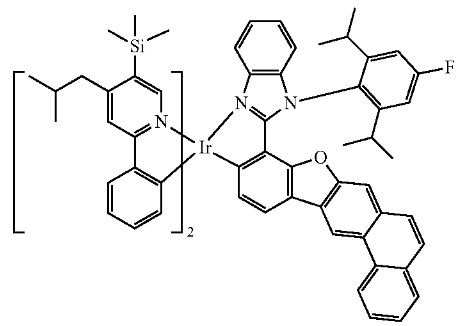

-continued
3240
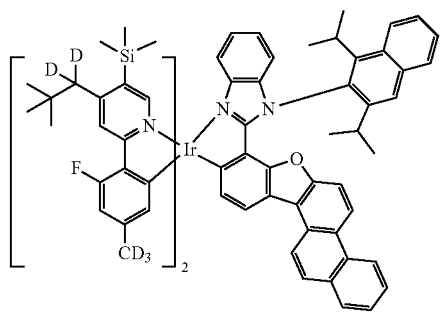
3241
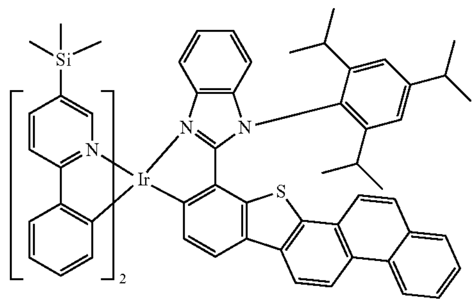
3242
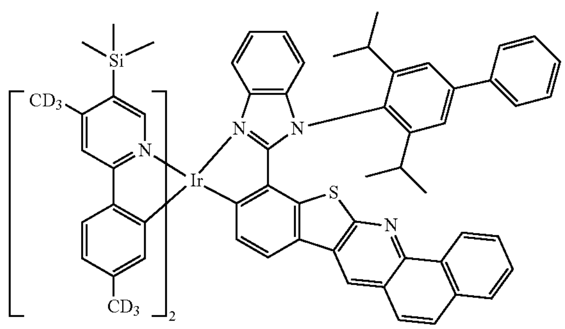
3243
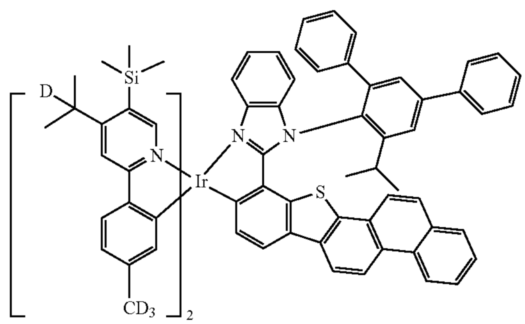
3244
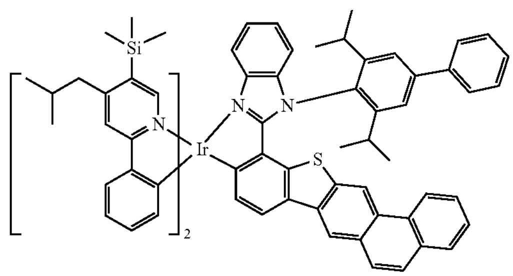
-continued
3245
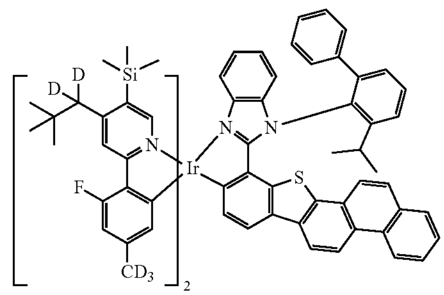
3246
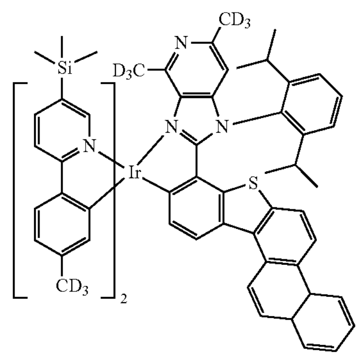
3247
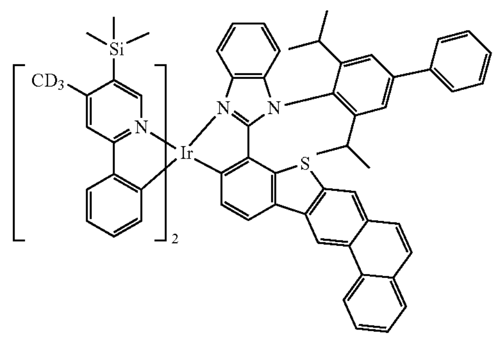
3248
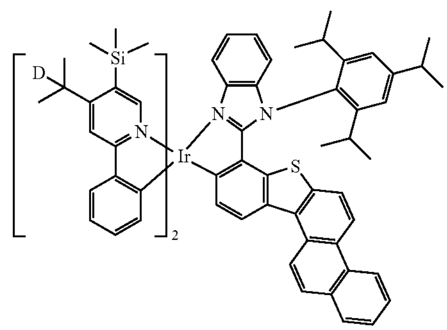

-continued
3249
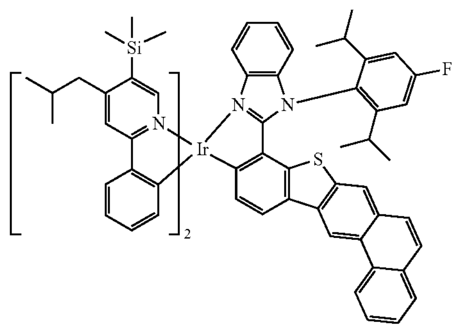
3250
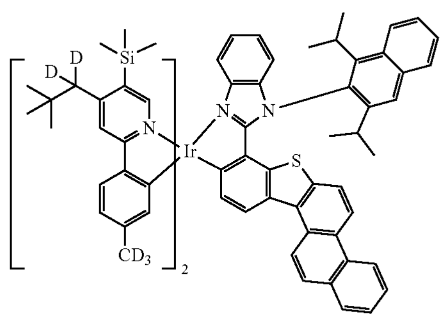
3251
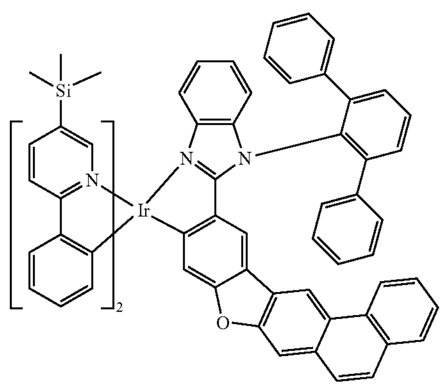
3252
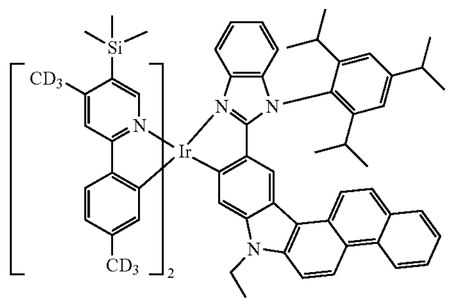
3253
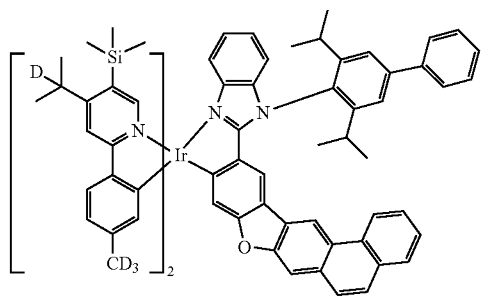
-continued
3254
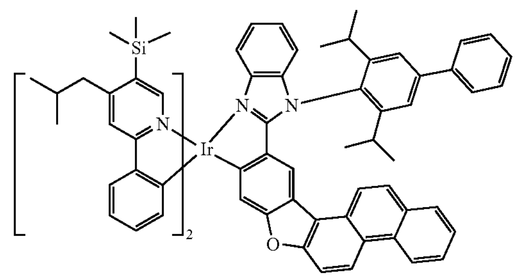
3255
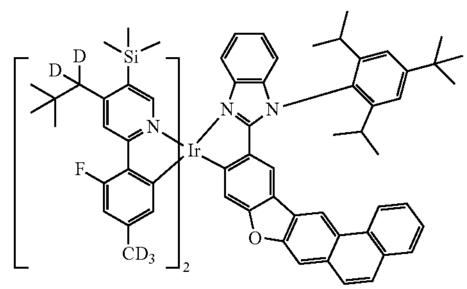
3256
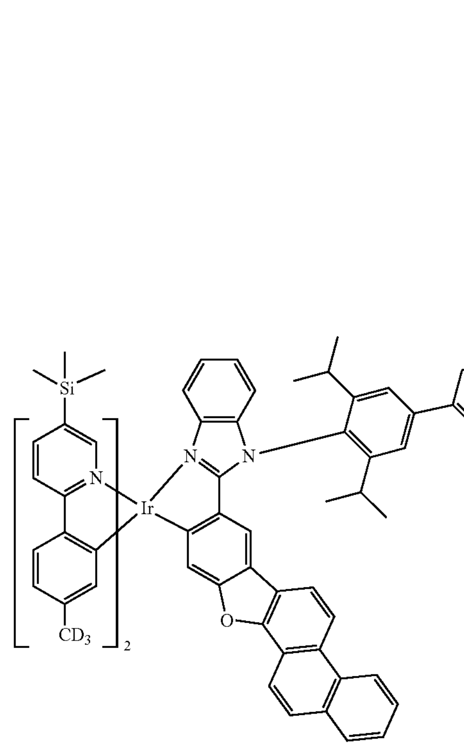
3257
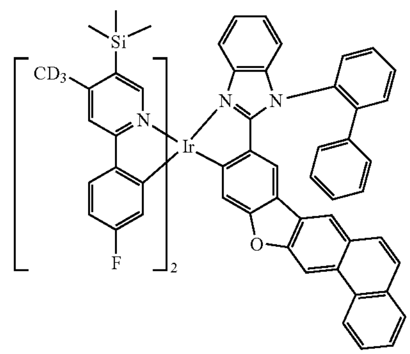

-continued
3258
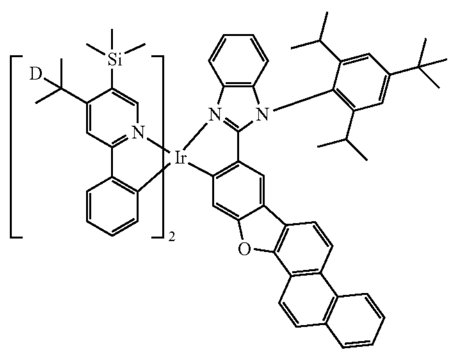
3259
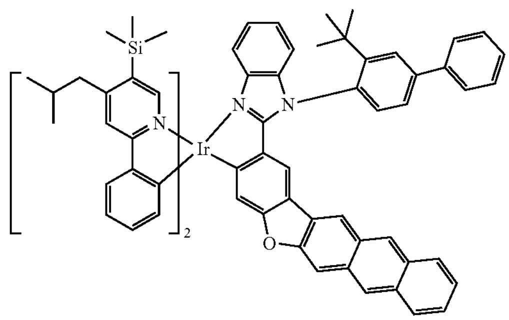
3260
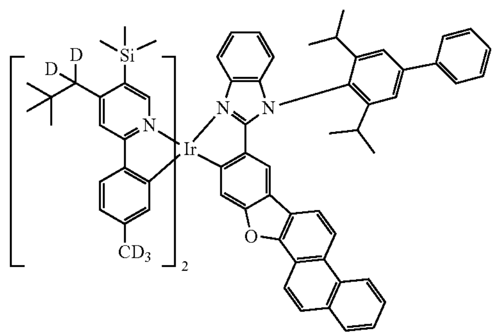
3261
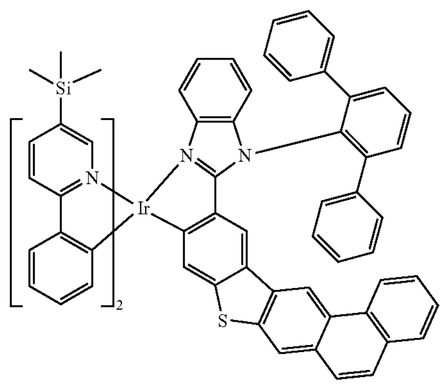
-continued
3262
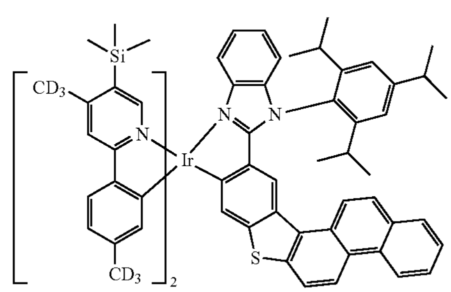
3263
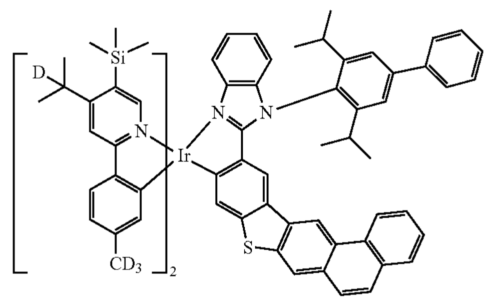
3264
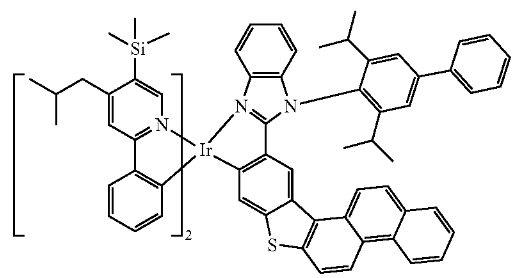
3265
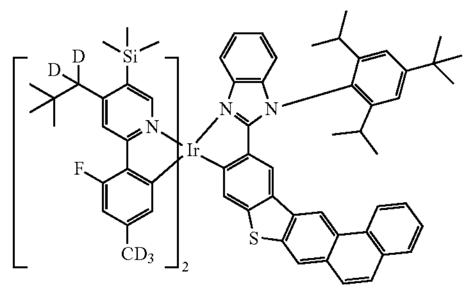
3266
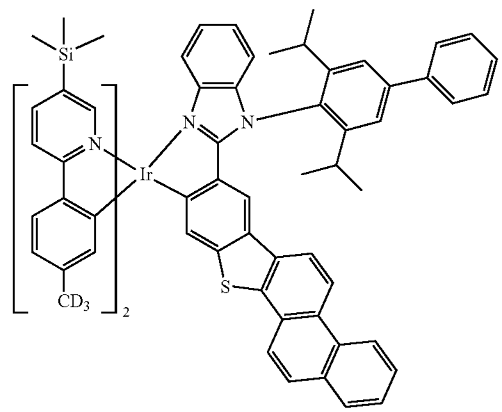

3267
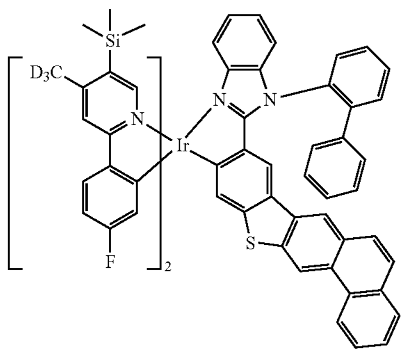
3268
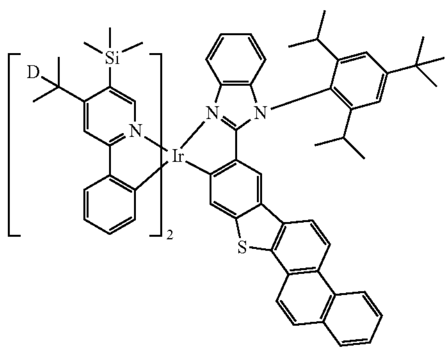
3269
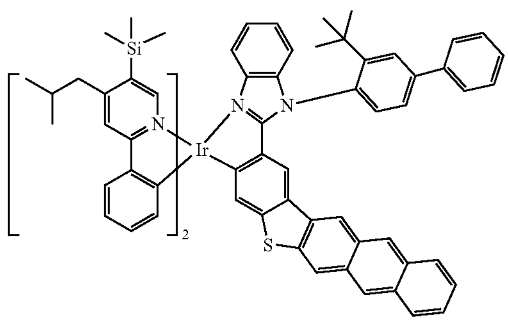
3270
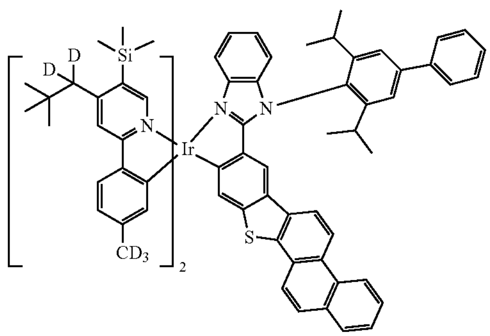
3271
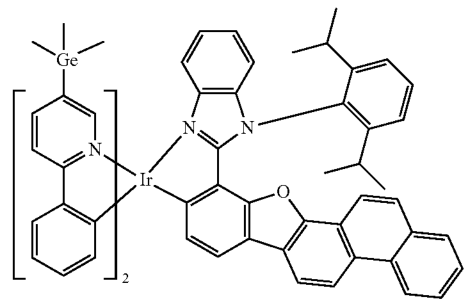
3272
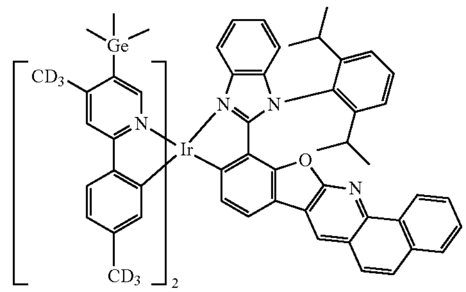
3273
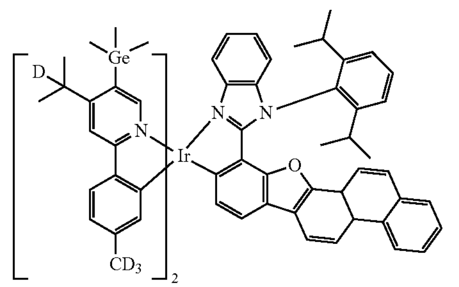
3274
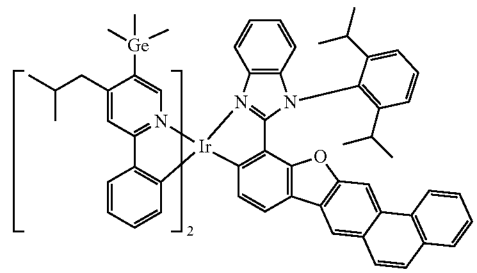
3275
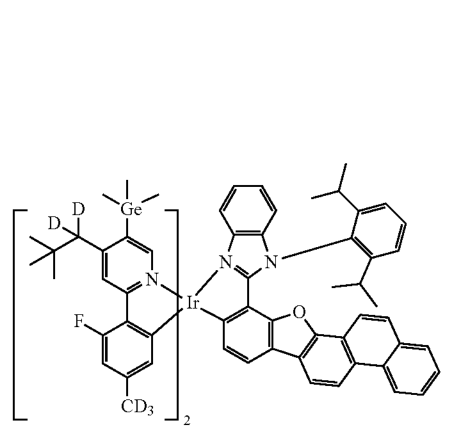

-continued
3276
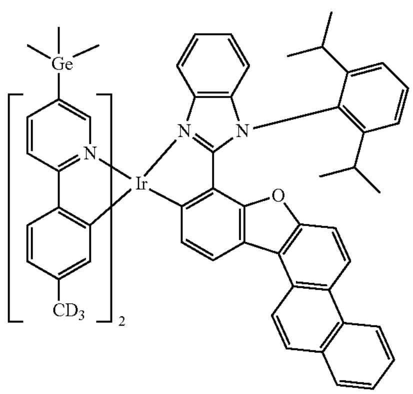
3277
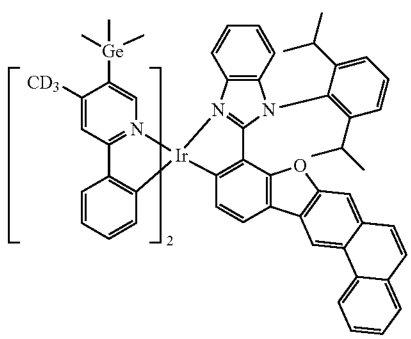
3278
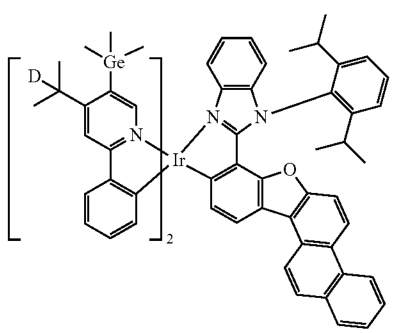
3279
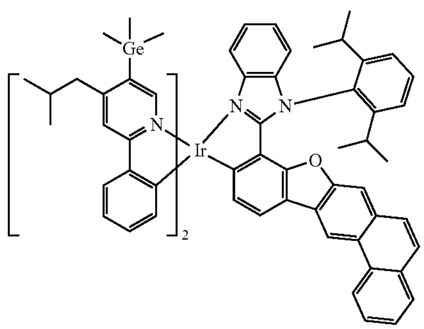
-continued
3280
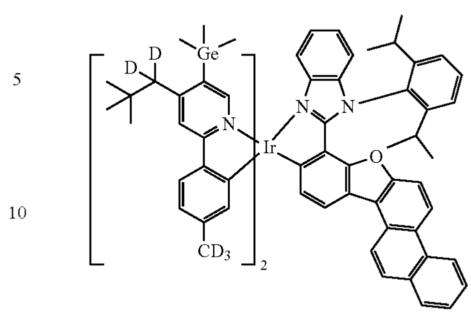
3281
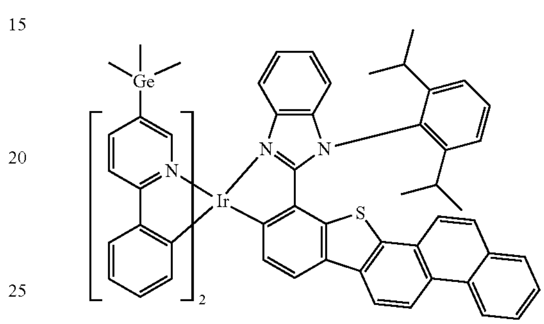
3282
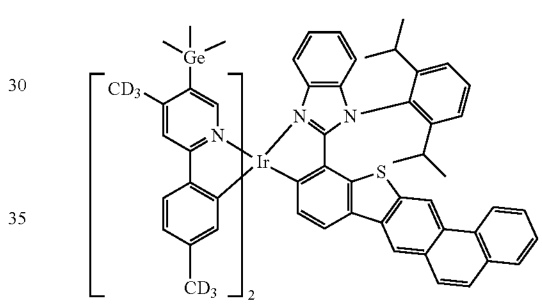
3283
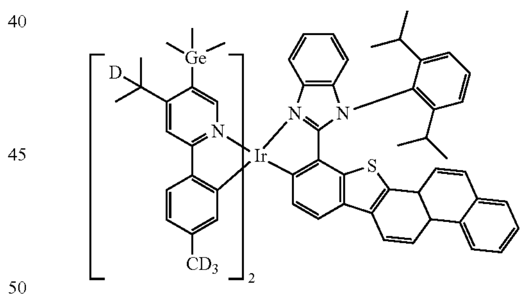
3284
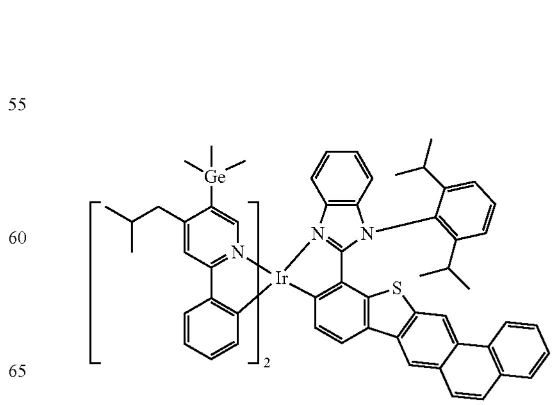

3285
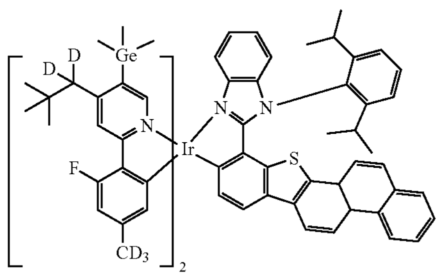
3286
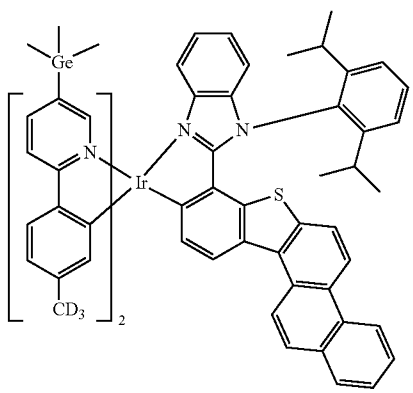
3287
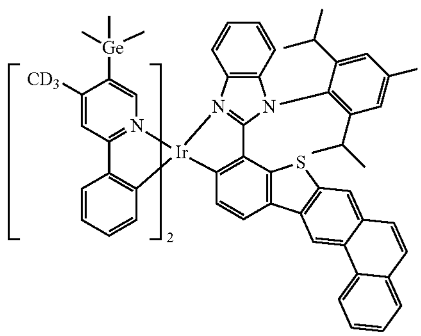
3288
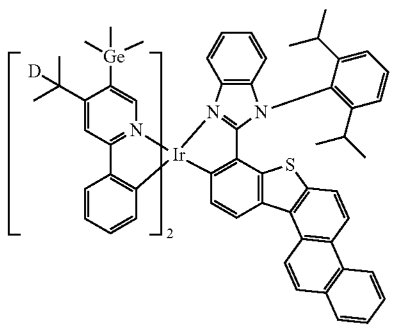
3289
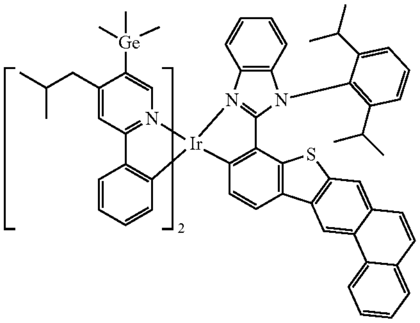
3290
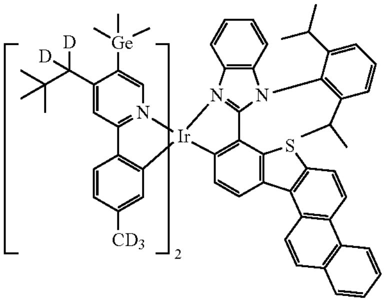
3291
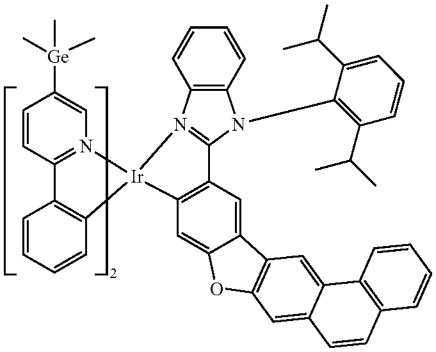
3292
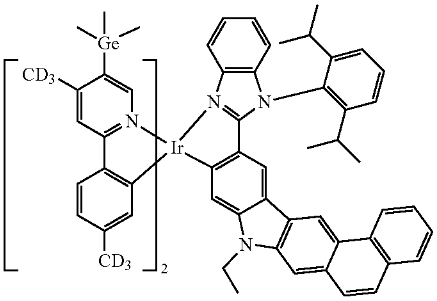
3293
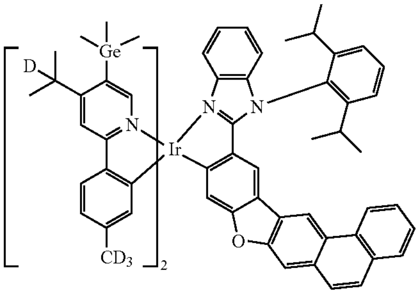

-continued
3294
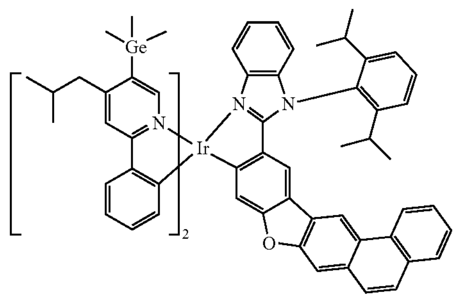
3295
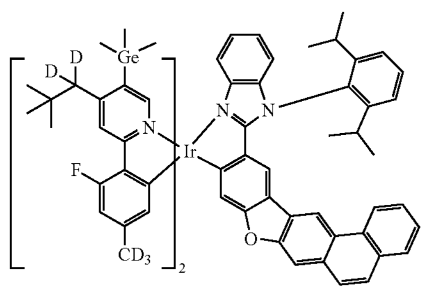
3296
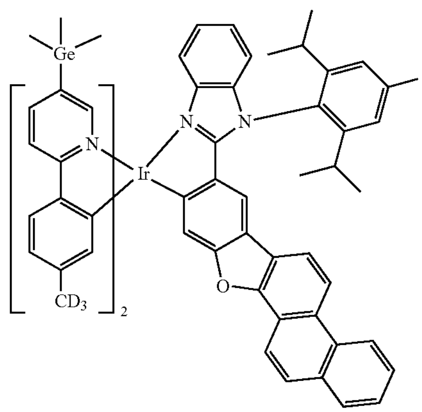
3297
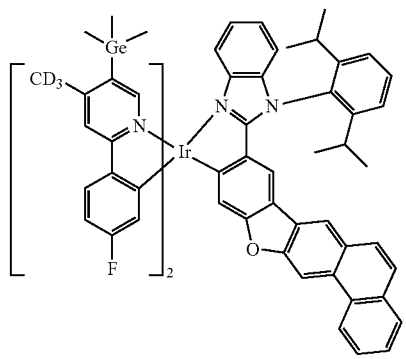
-continued
3298
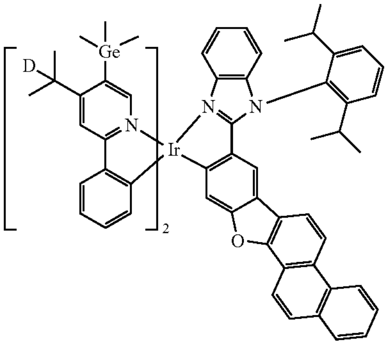
3299
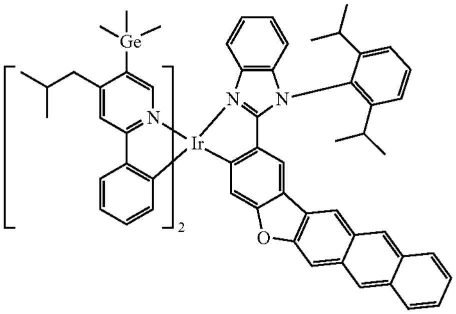
3300
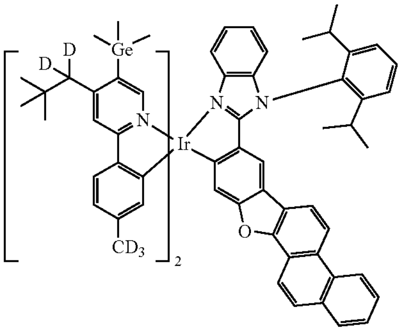
3301
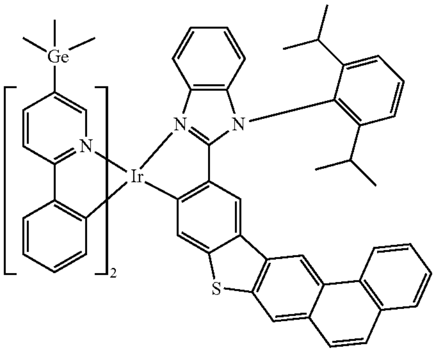

-continued
3302
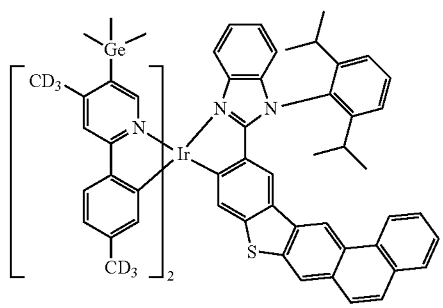
3303
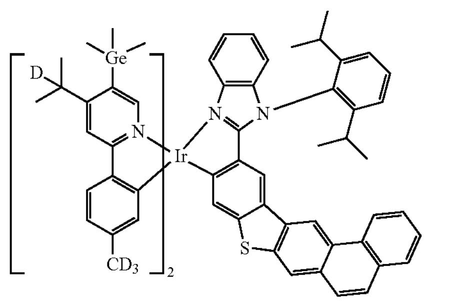
3304
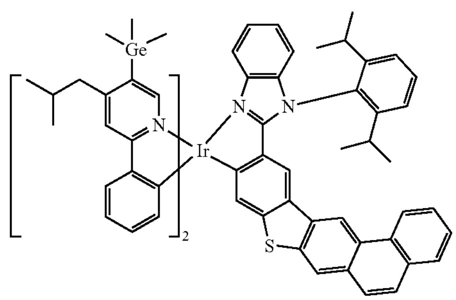
3305
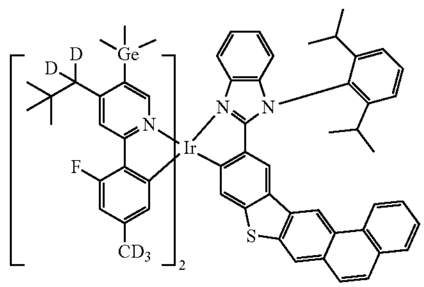
3306
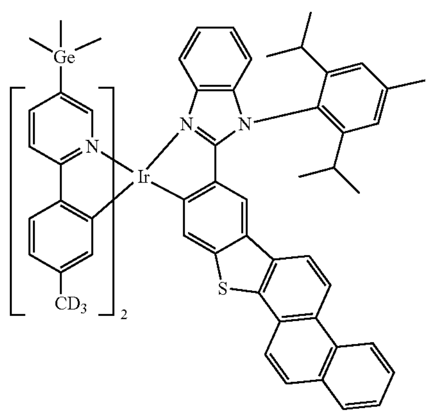
-continued
3307
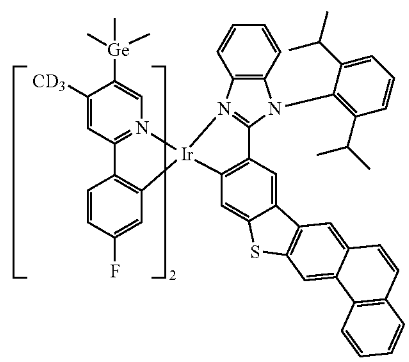
3308
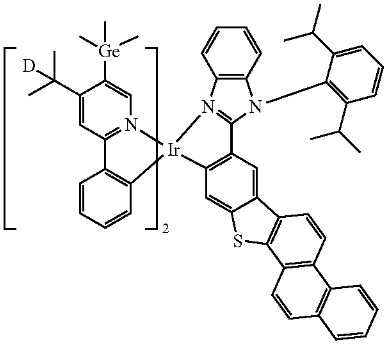
3309
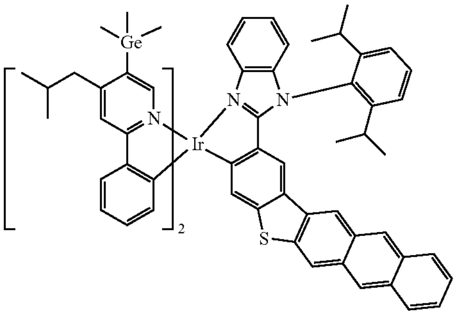
3310
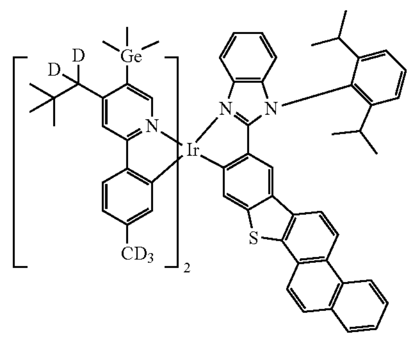

3311
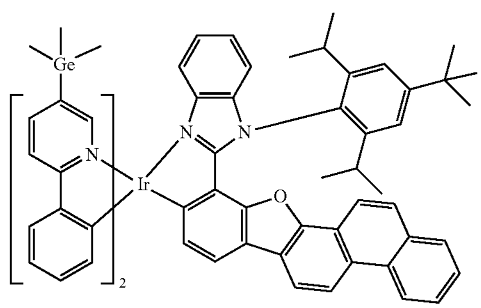
3312
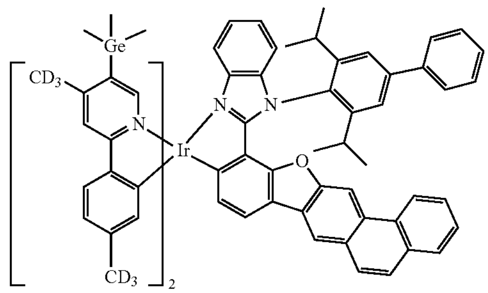
3313
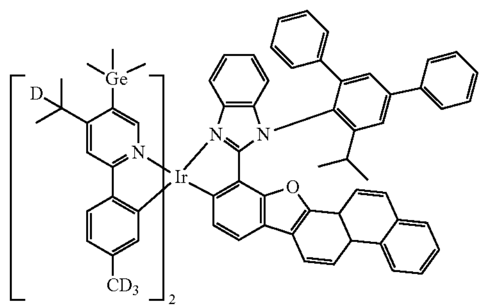
3314
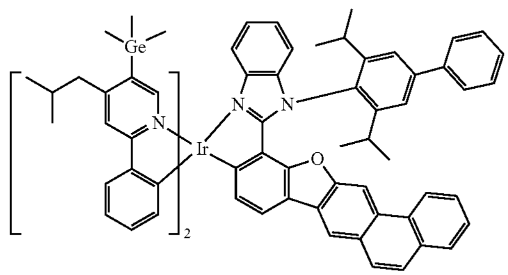
3315
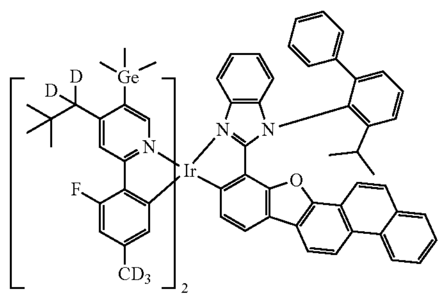
3316
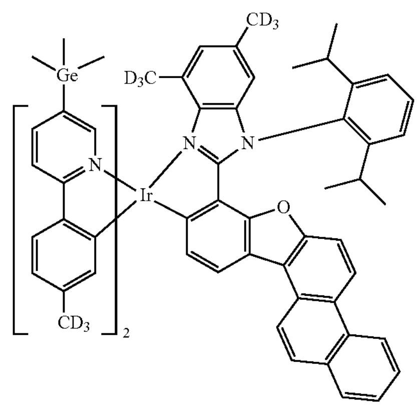
3317
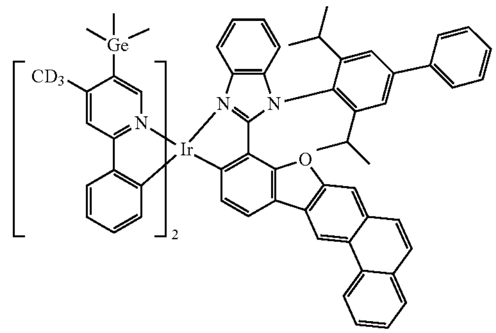
3318
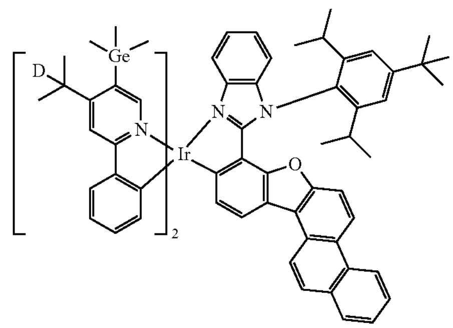
3319
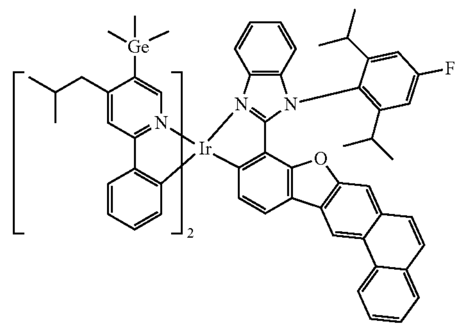

-continued
3320
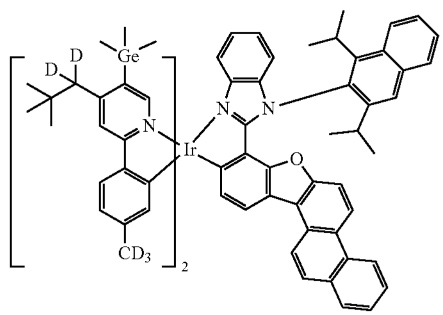
3321
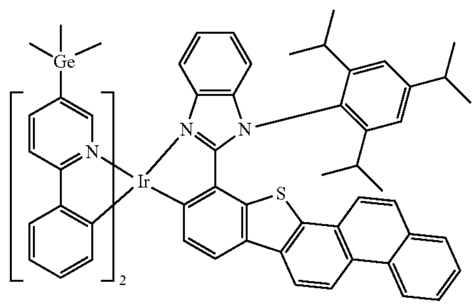
3322
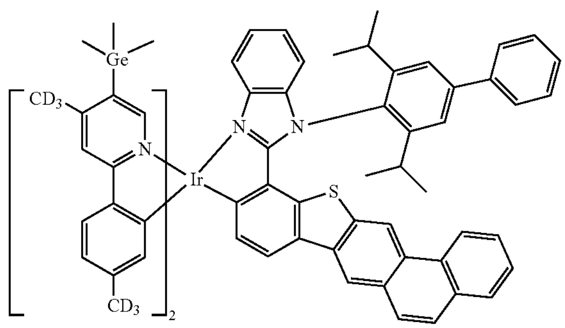
3323
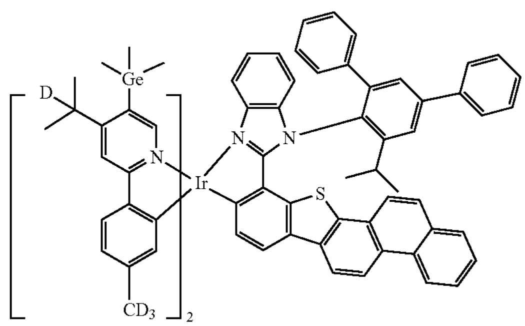
3324
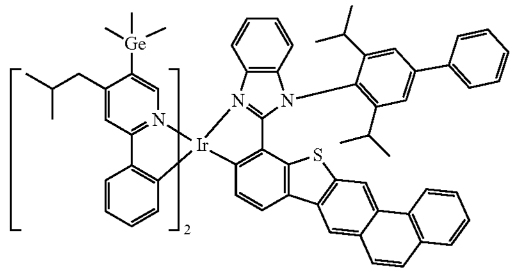
-continued
3325
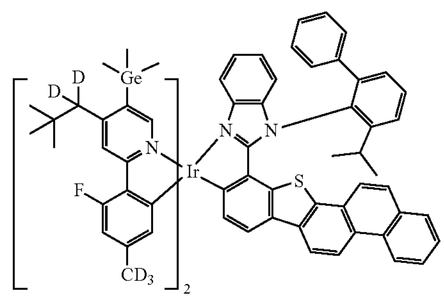
3326
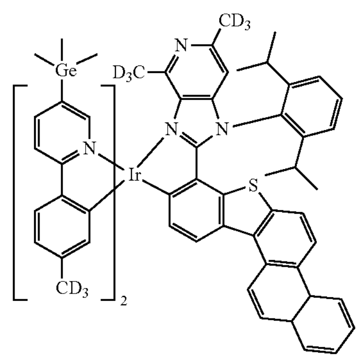
3327
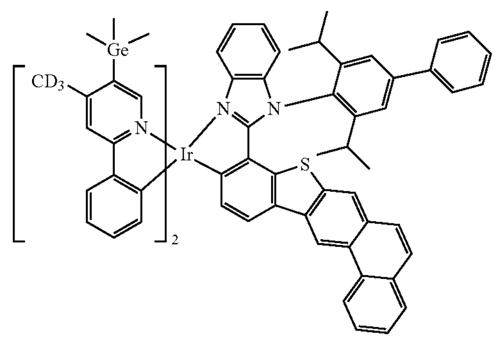
3328
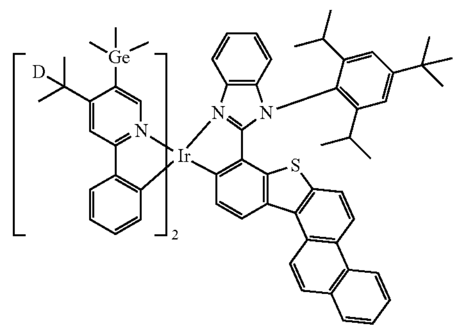

-continued
3329
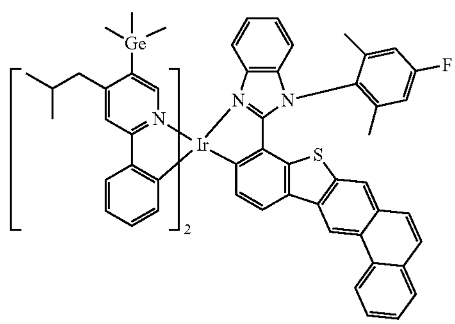
3330
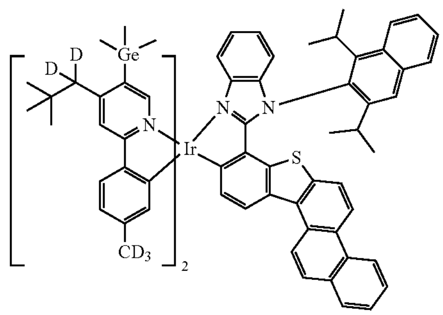
3331
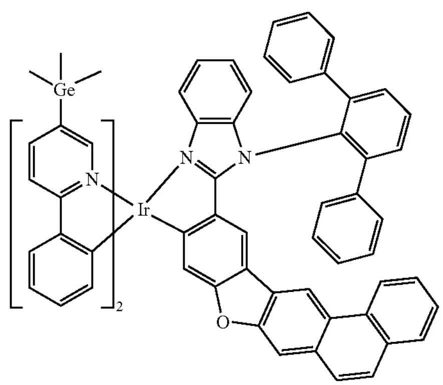
3332
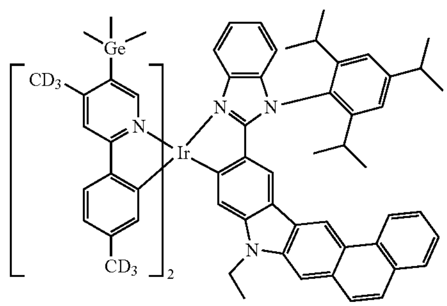
3333
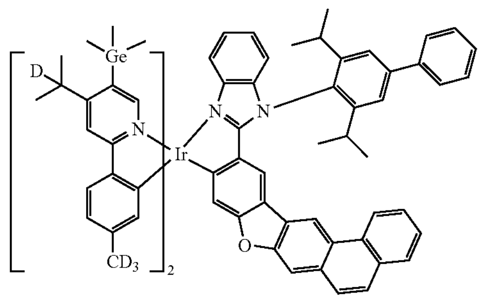
-continued
3334
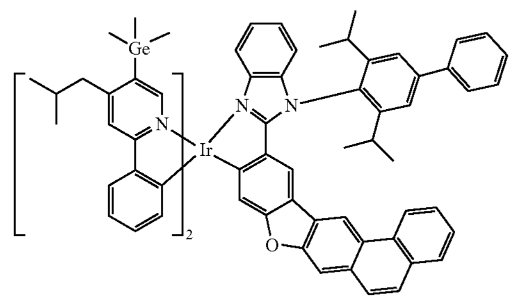
3335
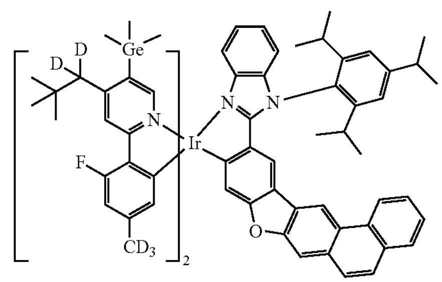
3336
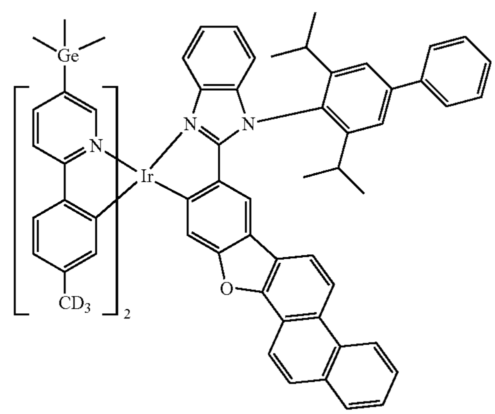
3337
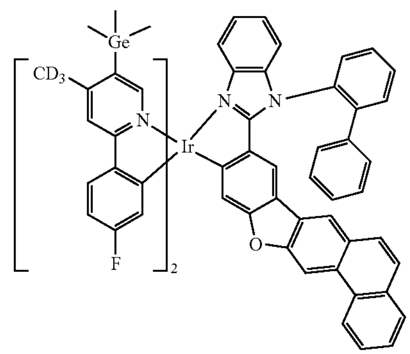

-continued
3338
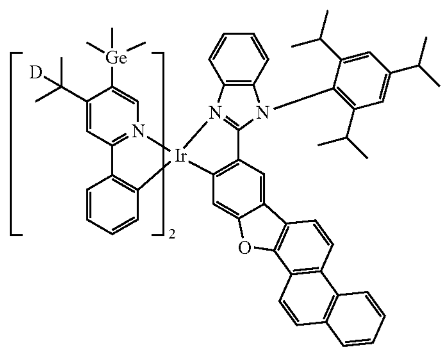
3339
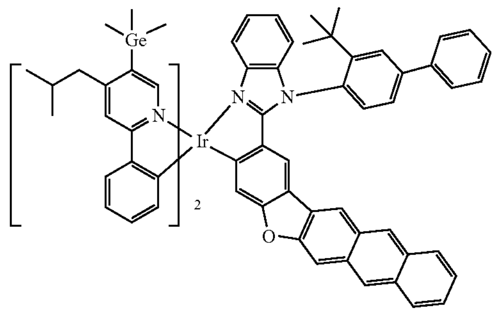
3340
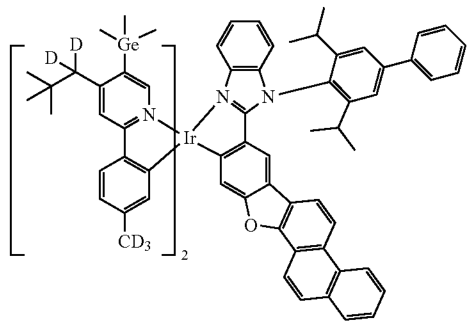
3341
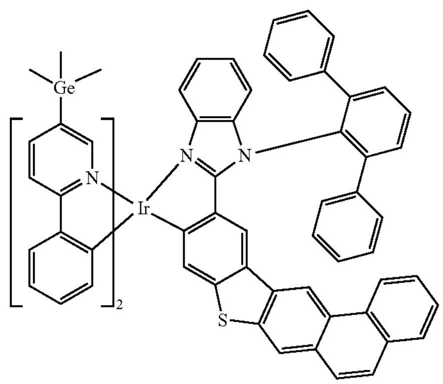
-continued
3342
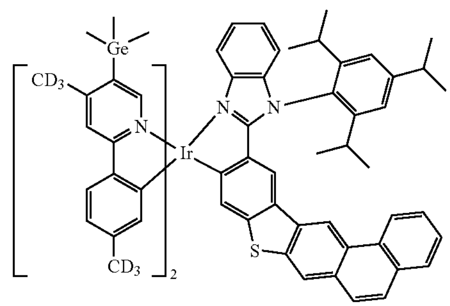
3343
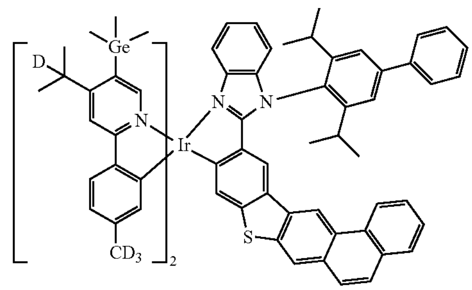
3344
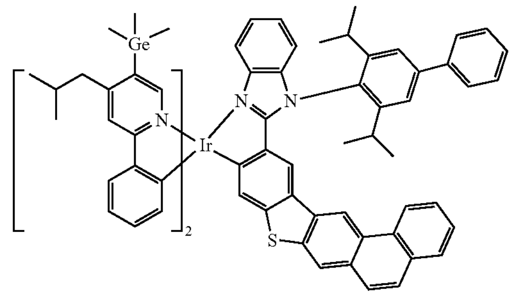
3345
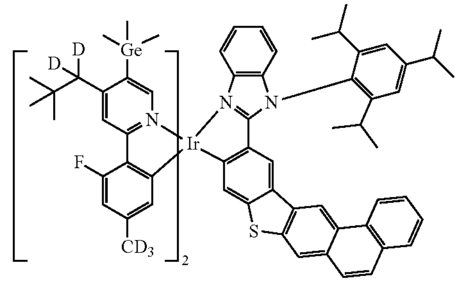
3346
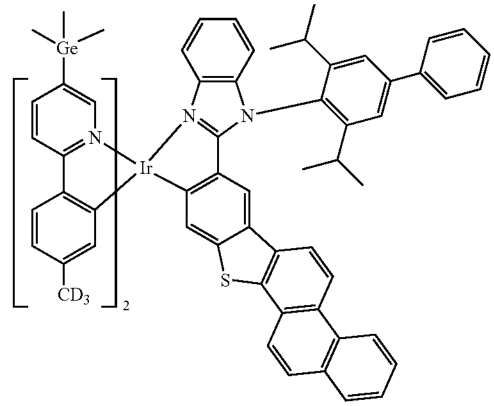

-continued
3347
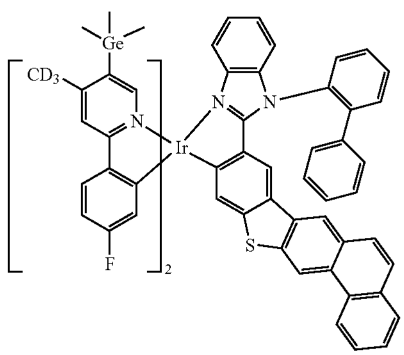
3348
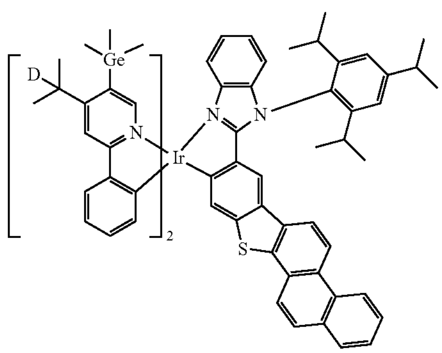
3349
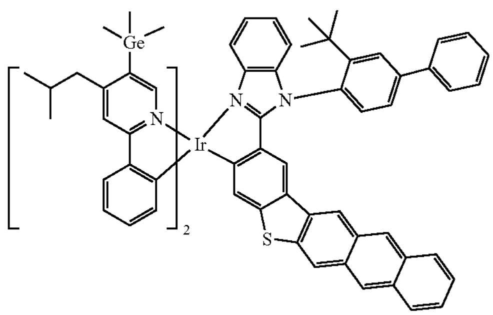
3350
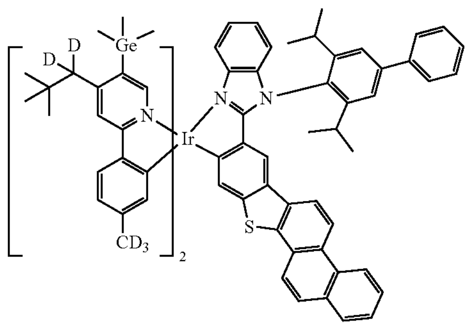
Group 1-4
1
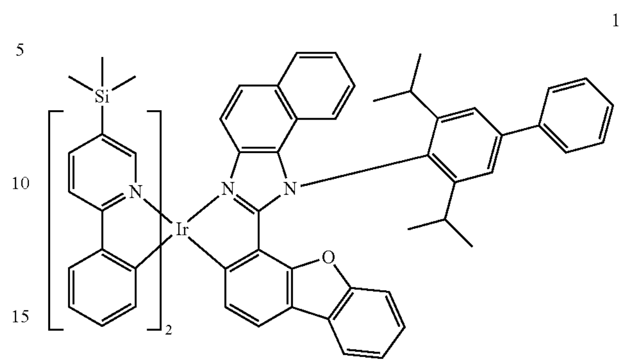
2
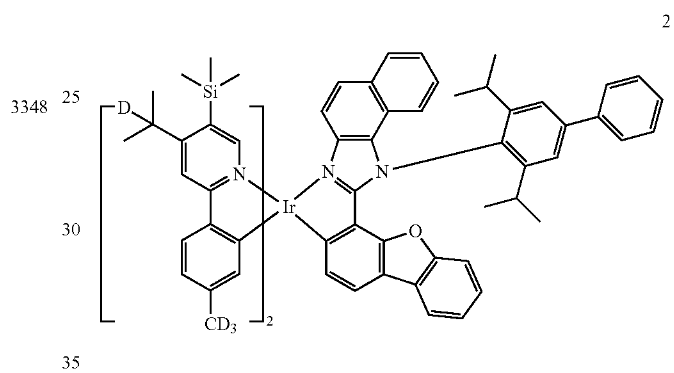
3
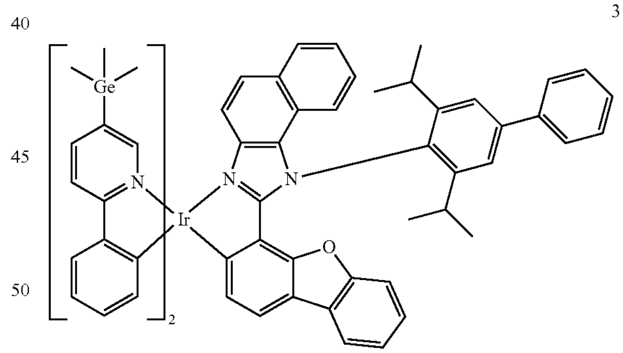
4
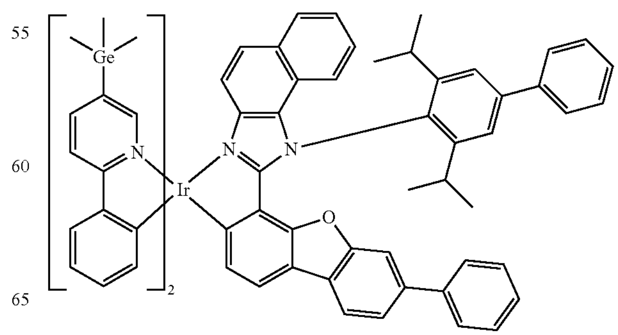

-continued
5
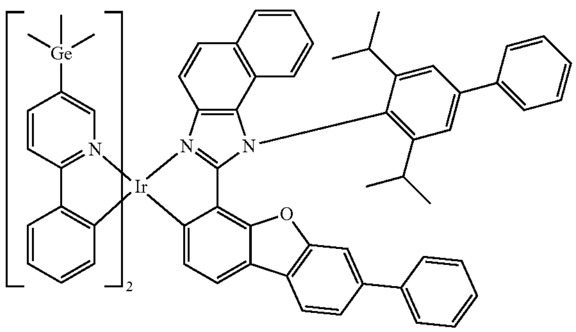
6
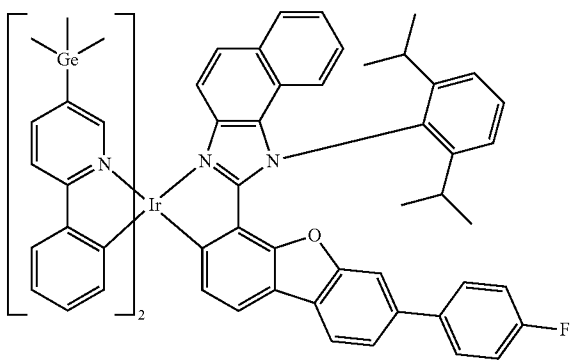
7
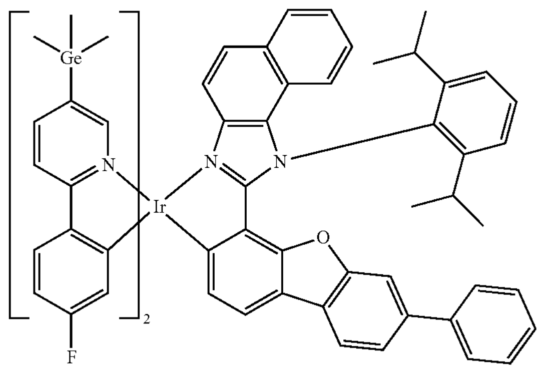
8
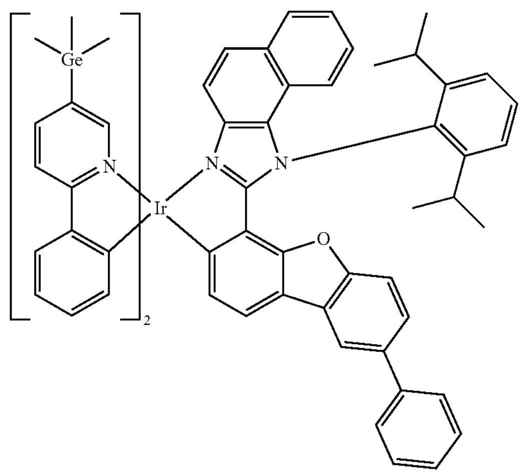
-continued
9
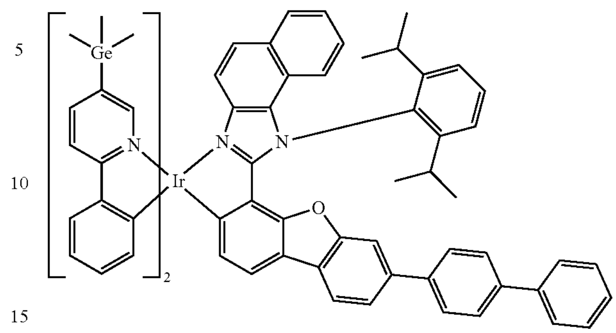
10
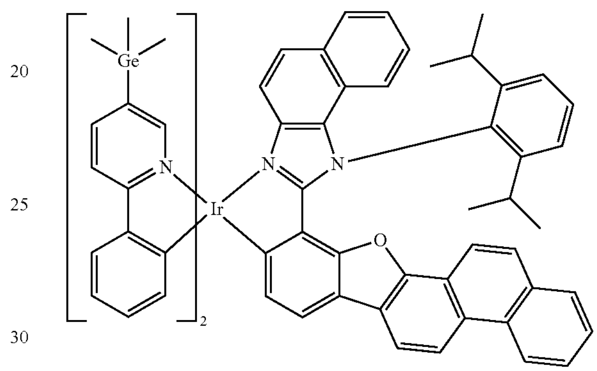
11
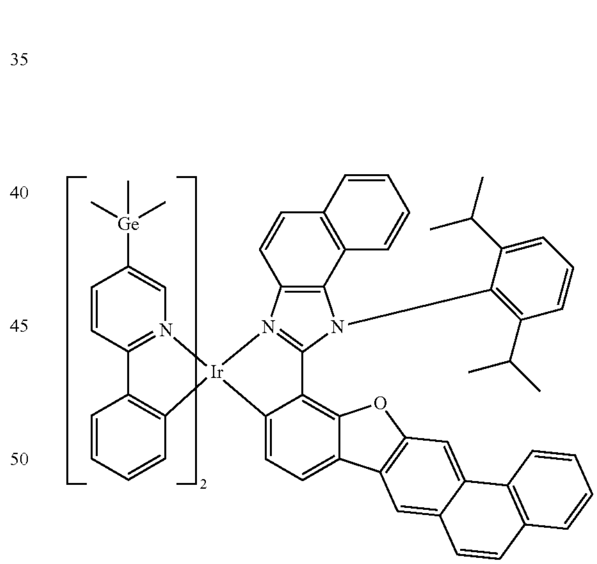
12
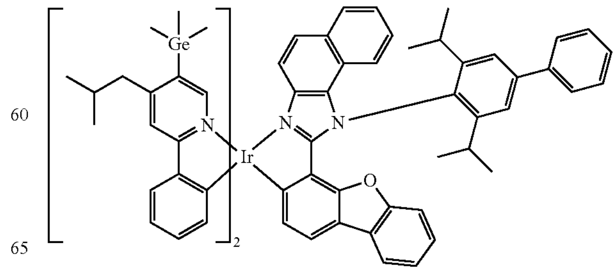

-continued
13
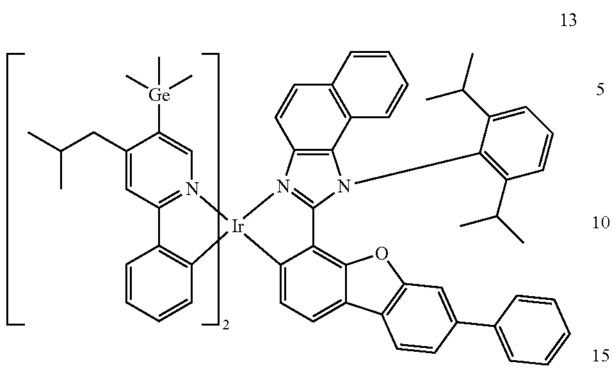
14
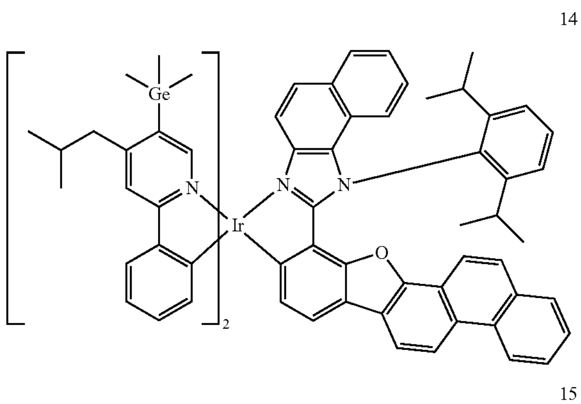
15
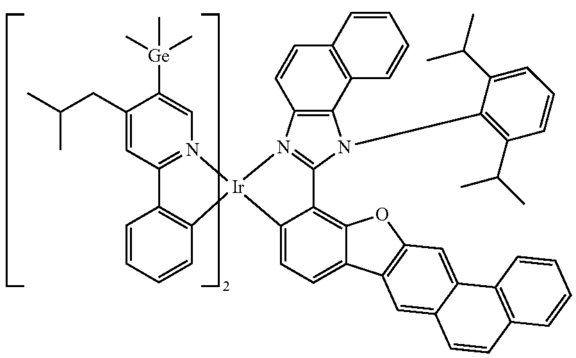
Group 1-5
1
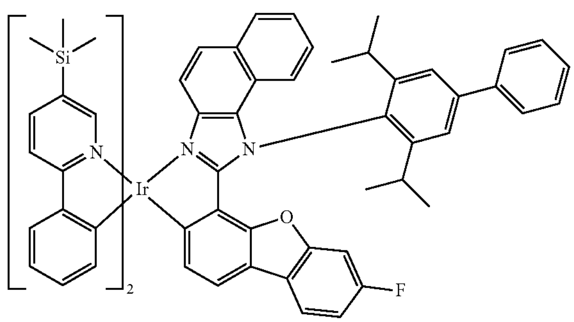
-continued
2
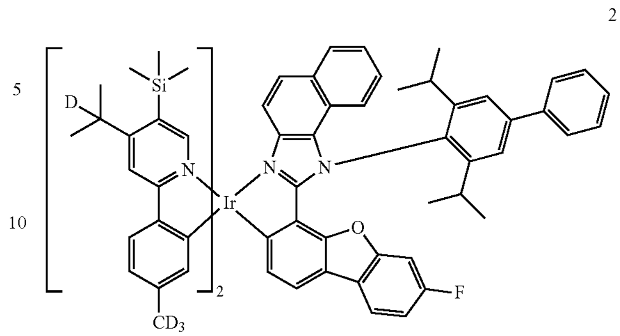
3
4
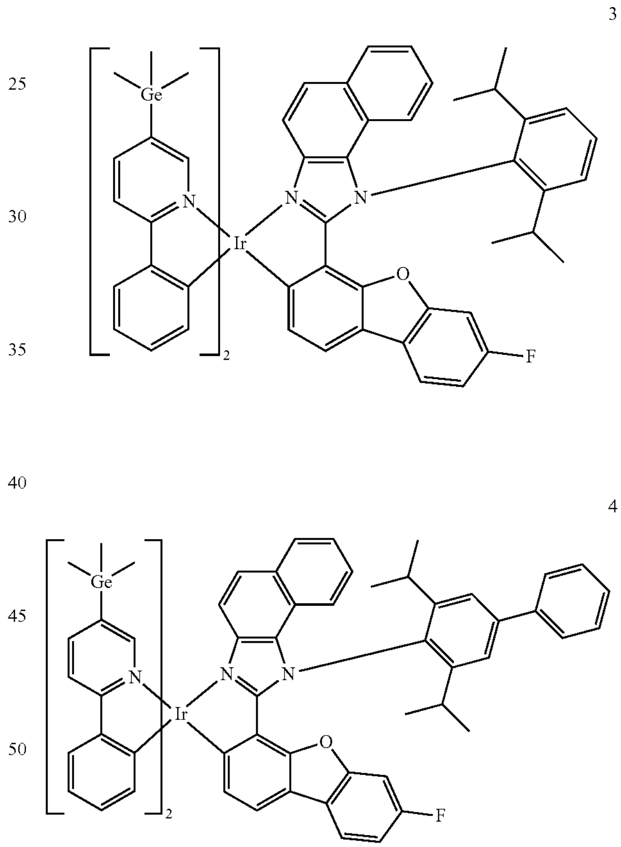
5
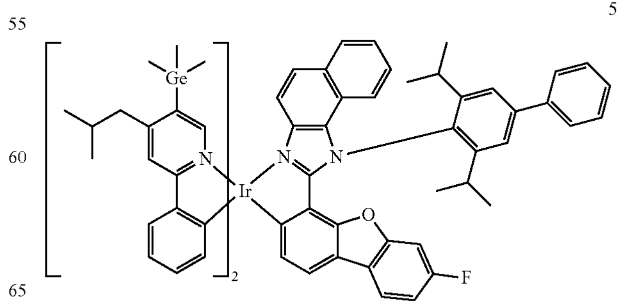

-continued
10
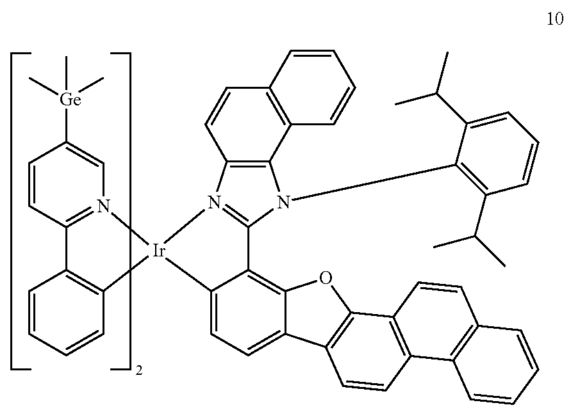
11
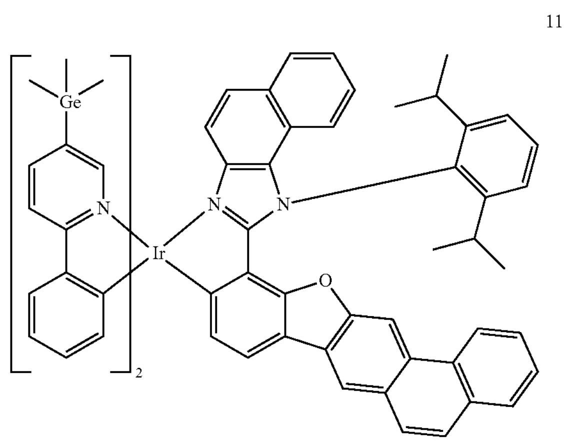
12
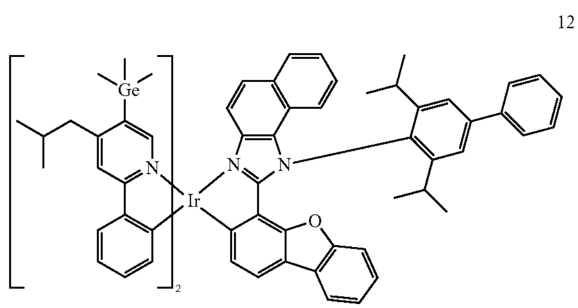
13
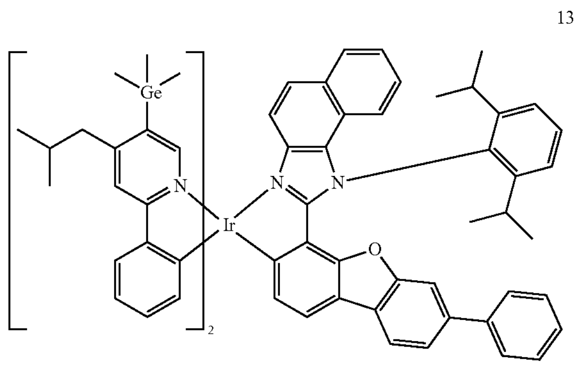
14
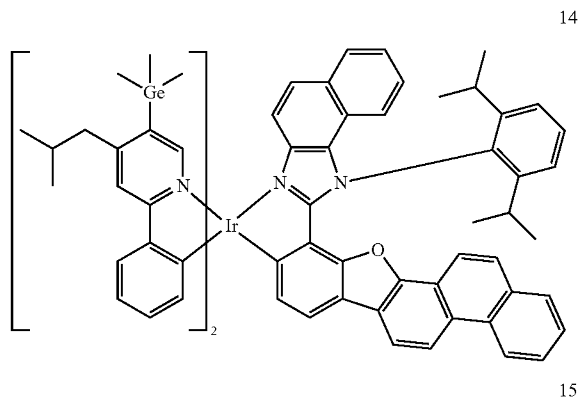
15
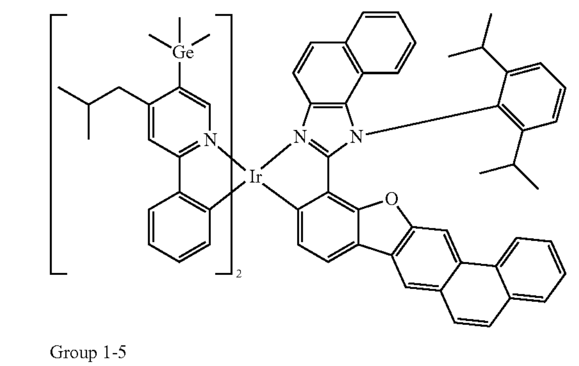
Group 1-5
1
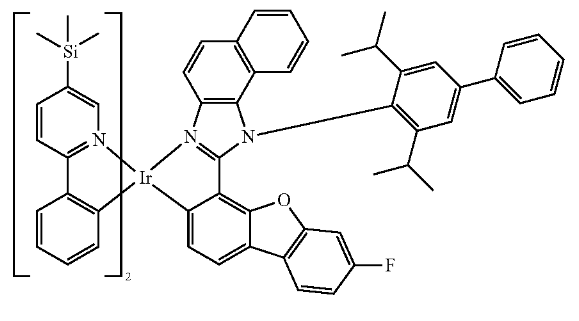
2
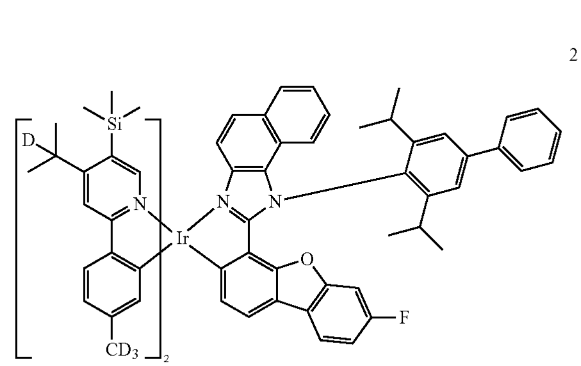

-continued
3
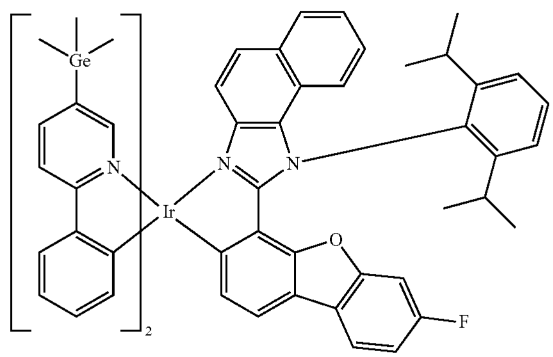
4
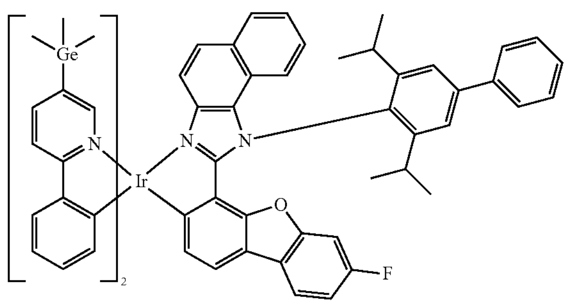
5
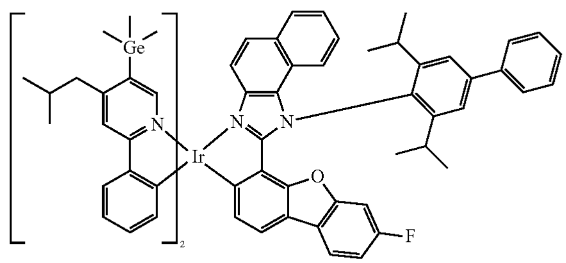
Group 1-6
1
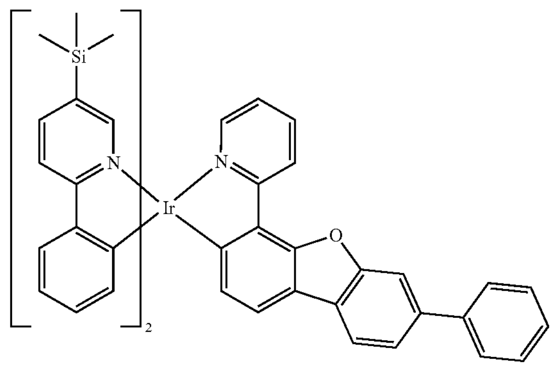
-continued
2
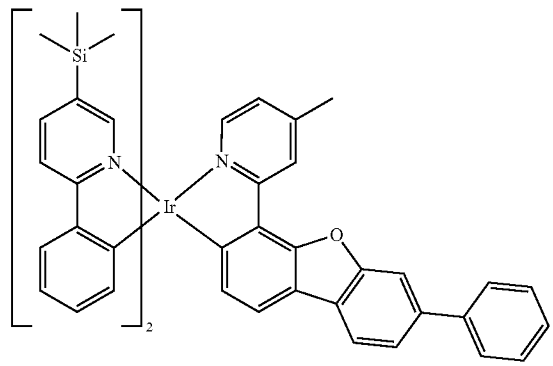
3
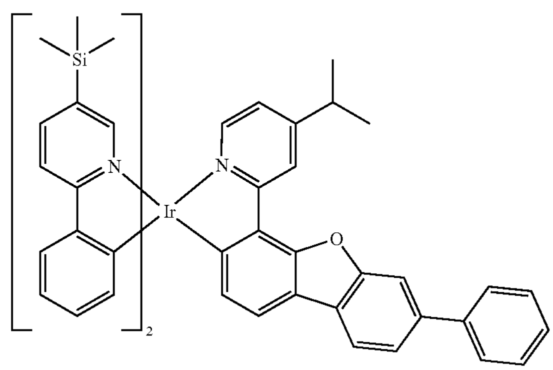
4
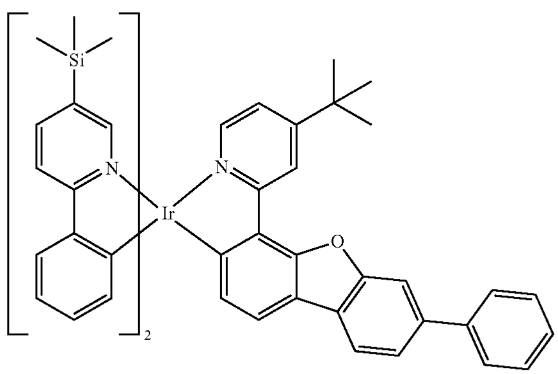
5
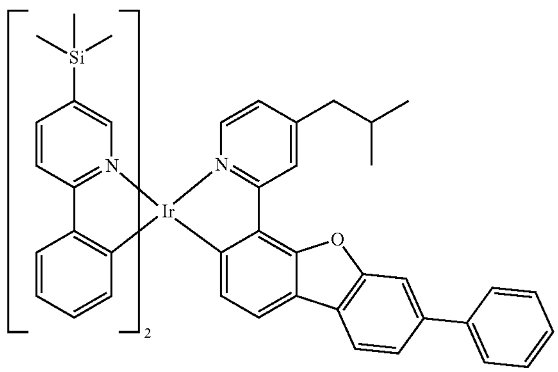

-continued
6
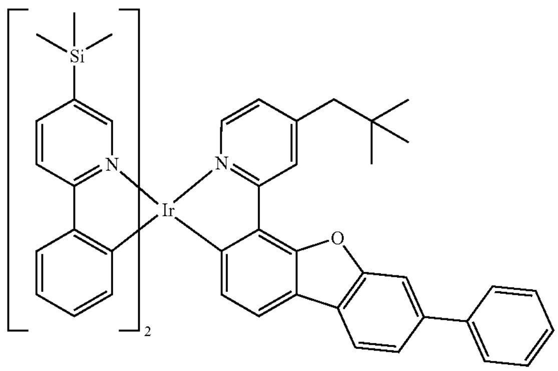
7
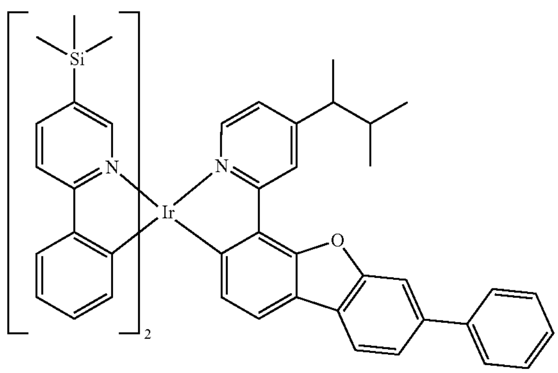
8
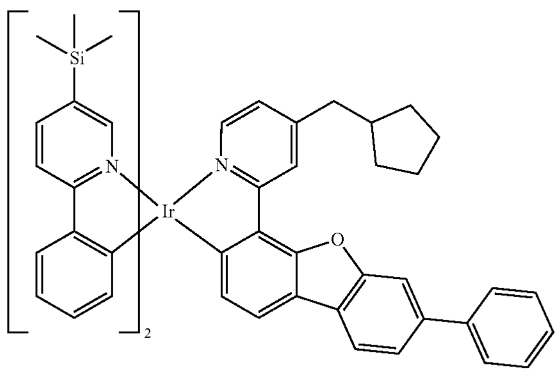
9
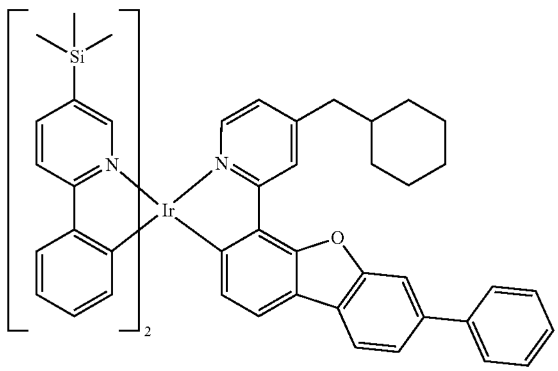
-continued
10
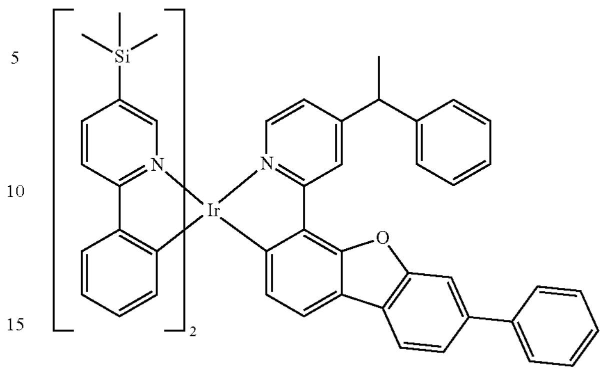
11
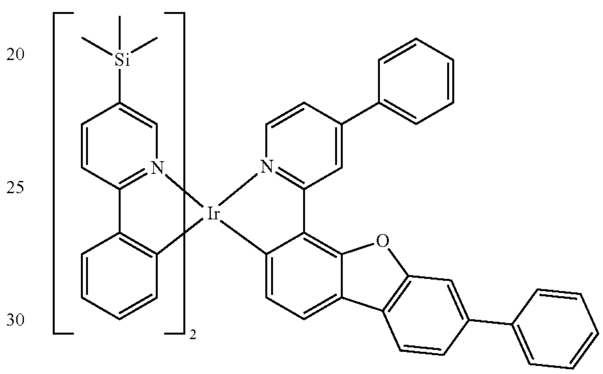
12
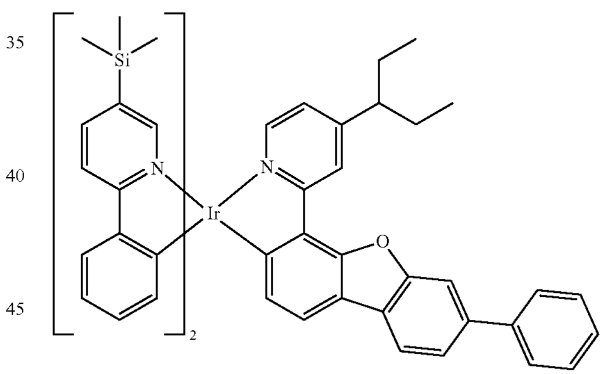
13
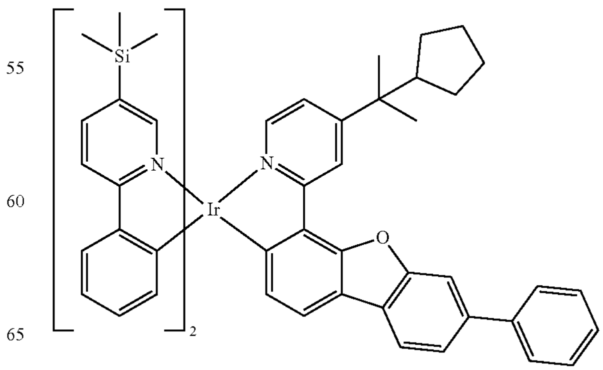

-continued
14
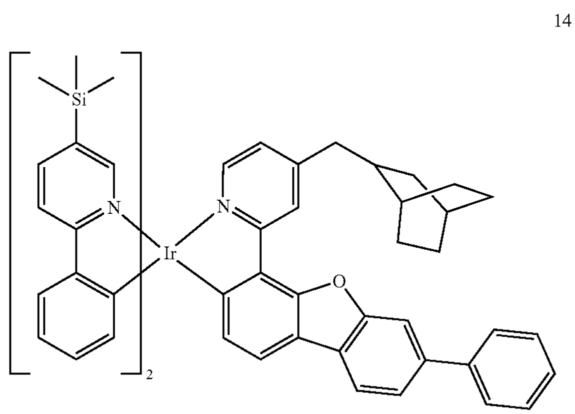
15
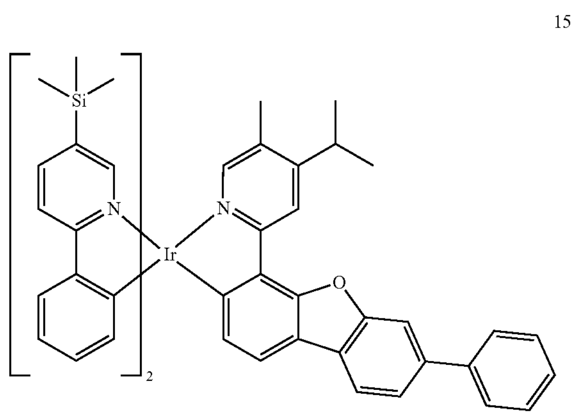
17
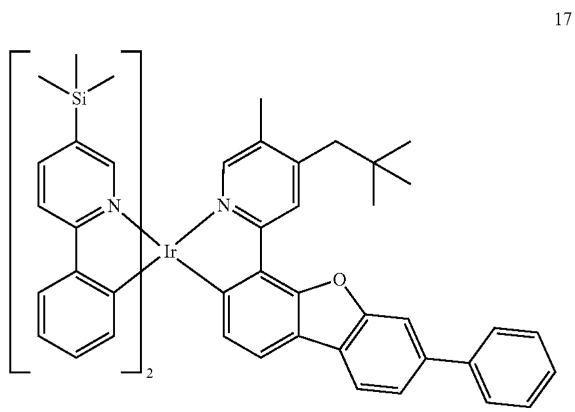
18
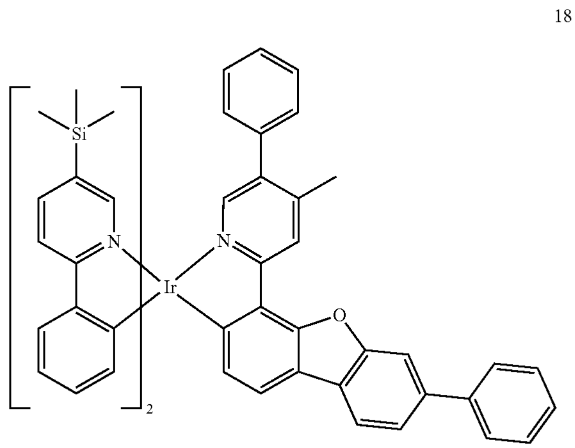
-continued
19
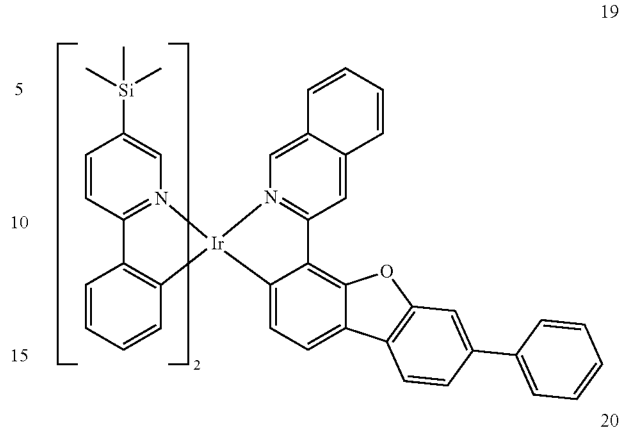
20
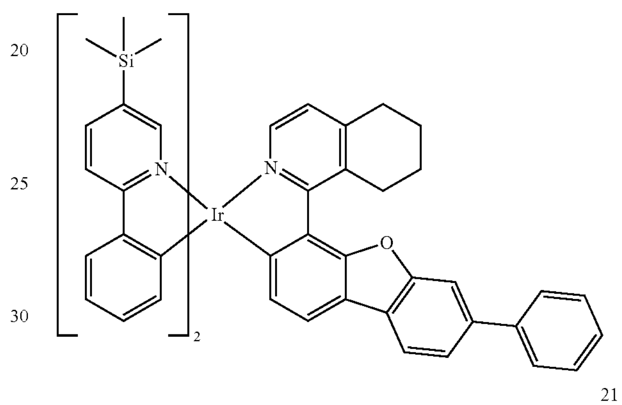
21
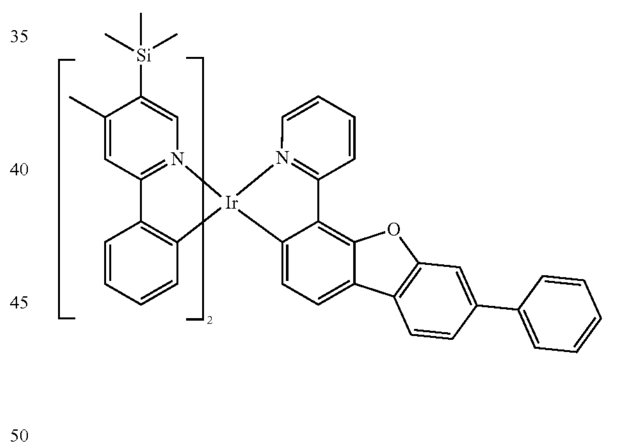
22
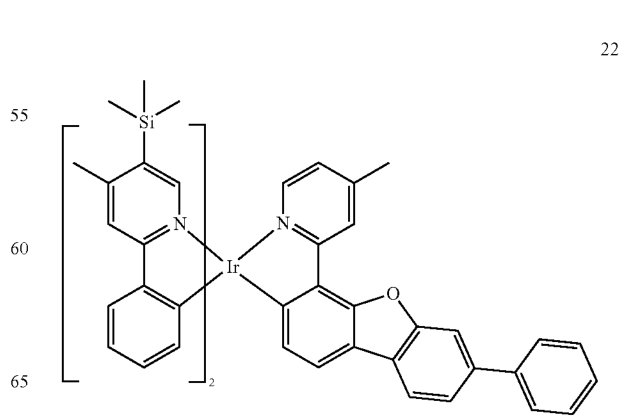

-continued
23
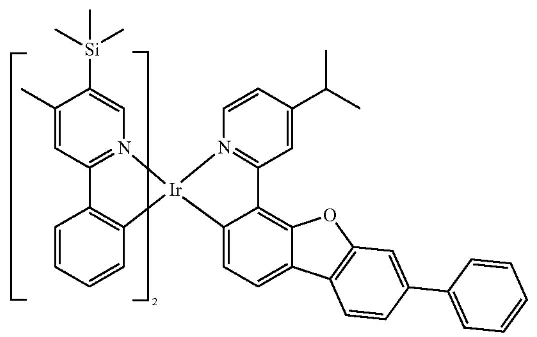
24
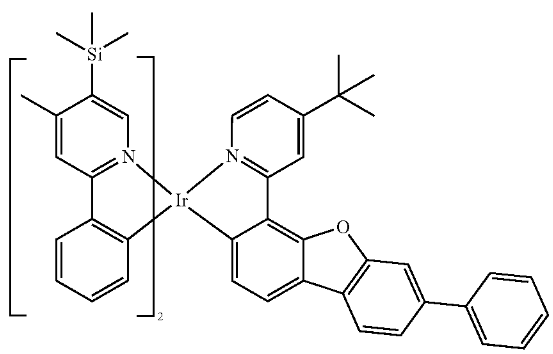
25
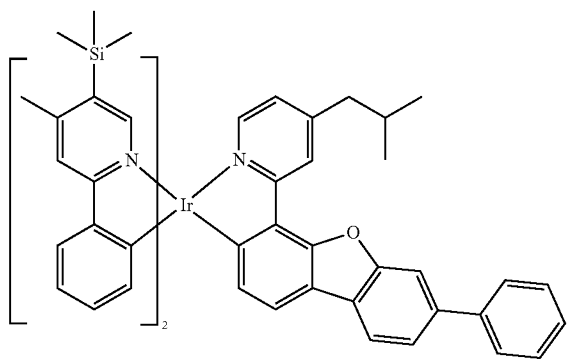
26
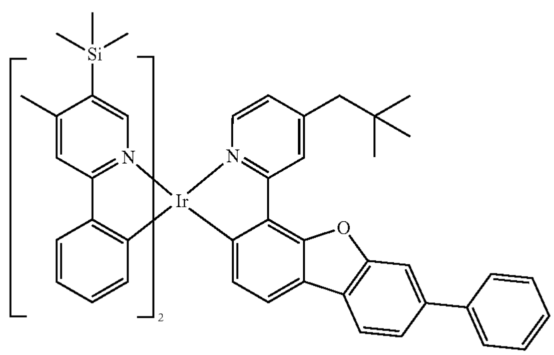
-continued
27
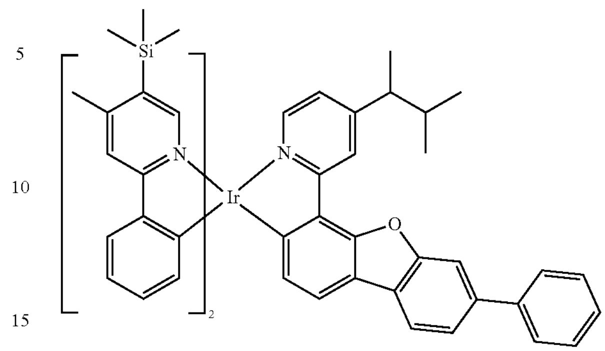
28
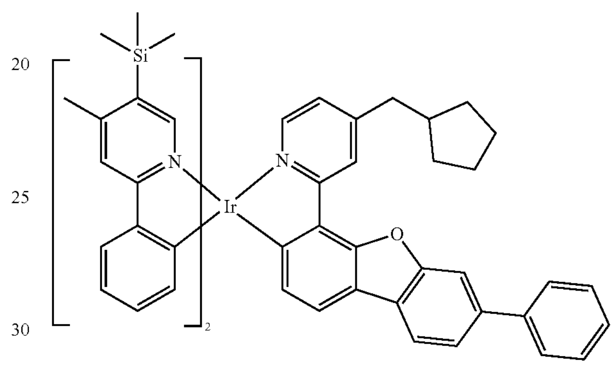
19
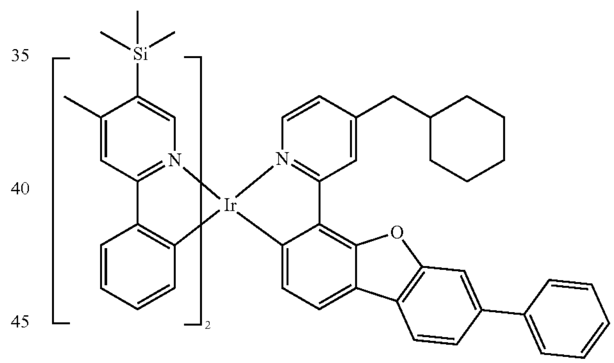
30
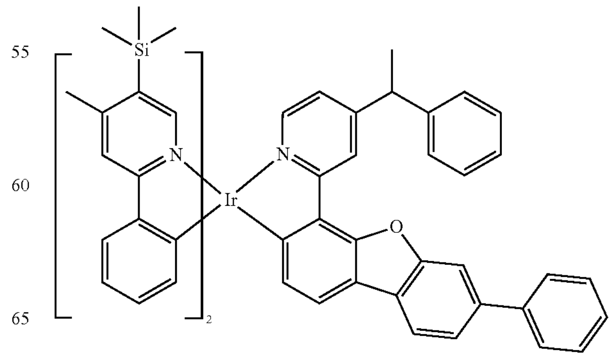

-continued
31
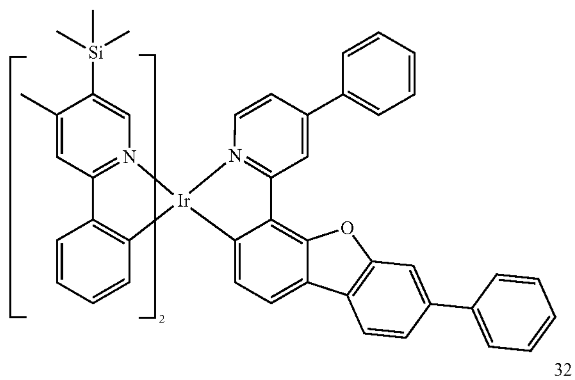
32
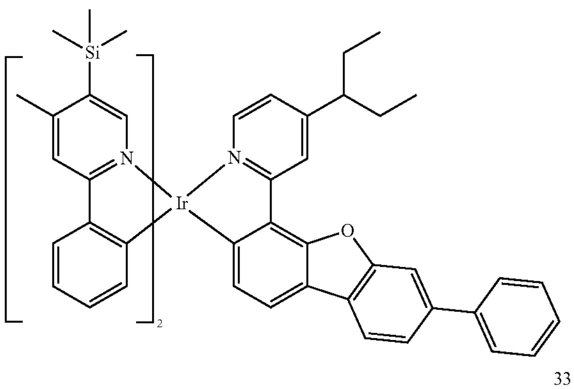
33
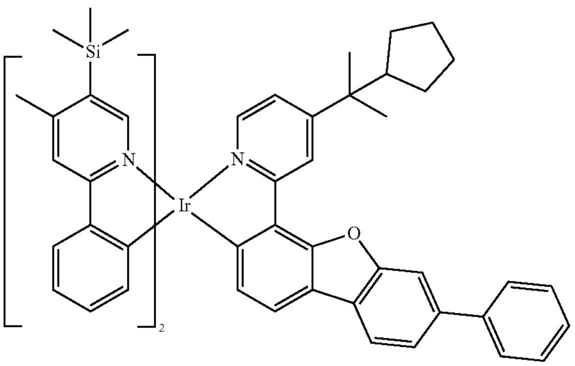
34
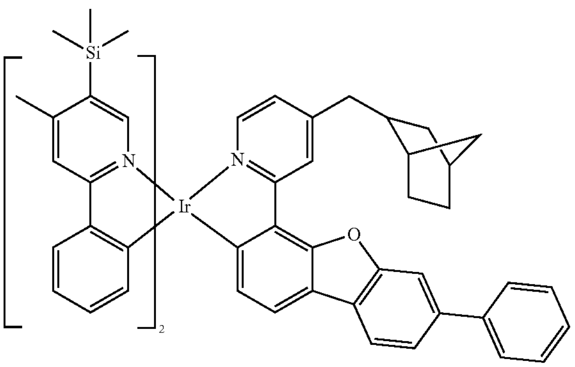
-continued
35
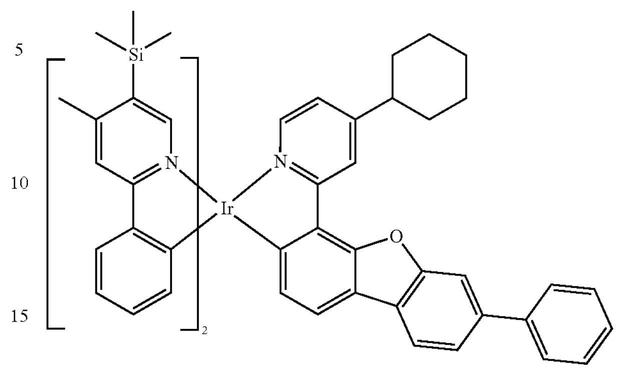
36
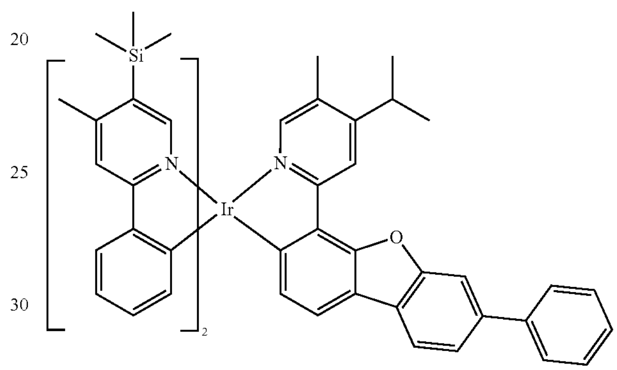
37
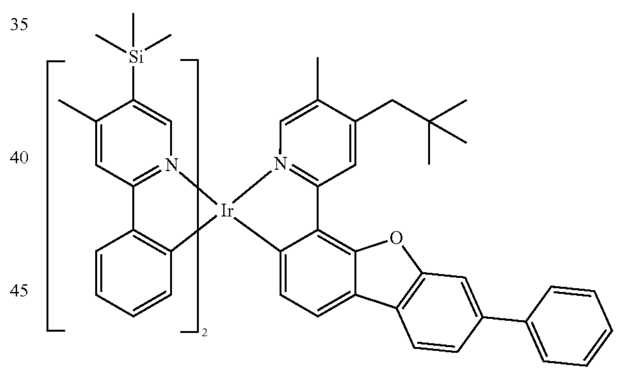
38
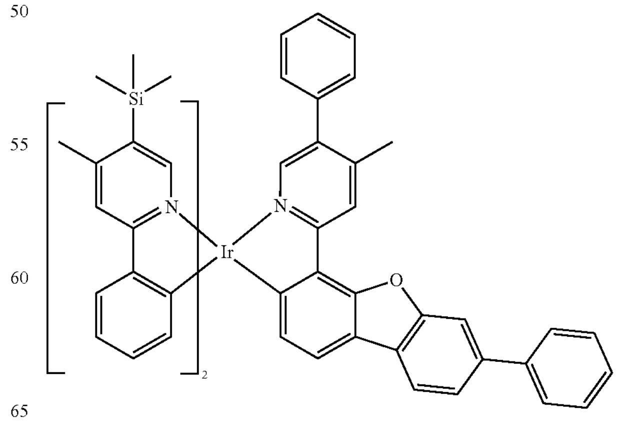

-continued
39
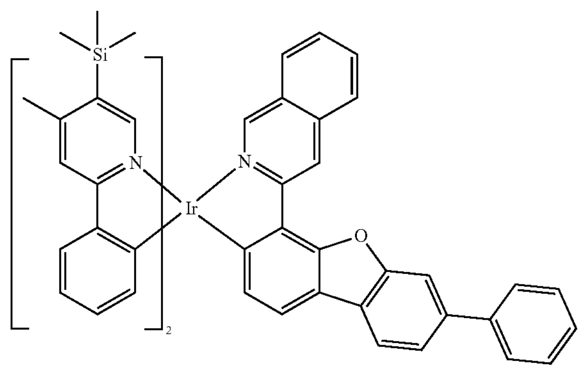
40
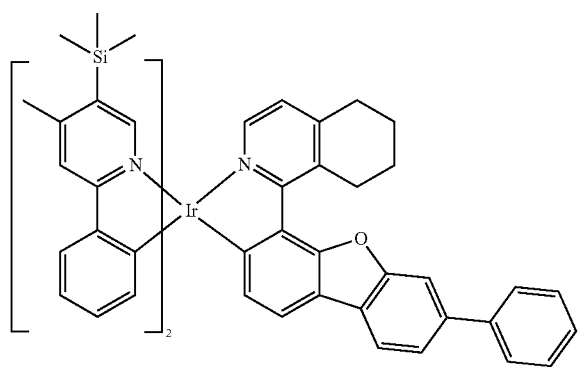
41
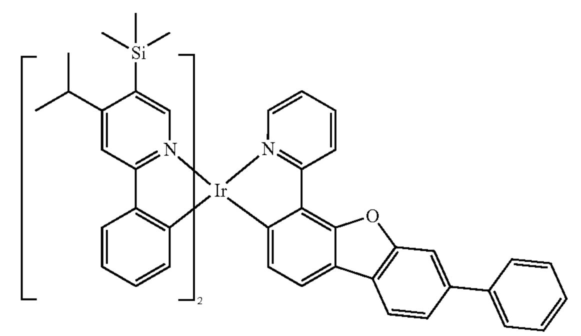
42
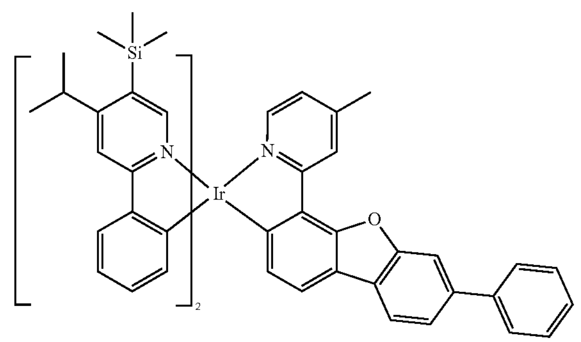
-continued
43
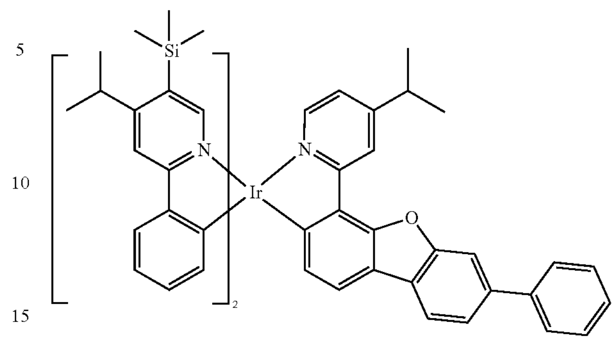
44
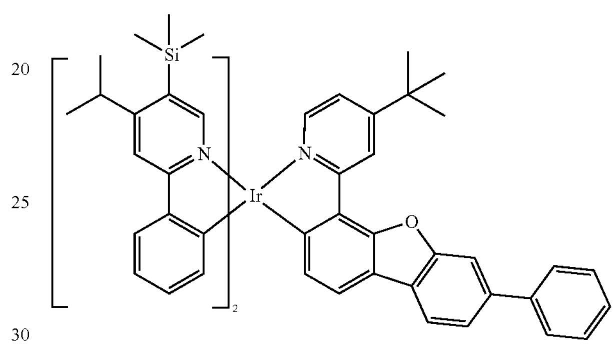
45
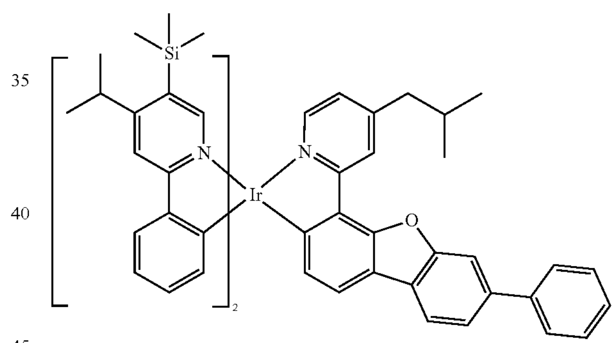
46
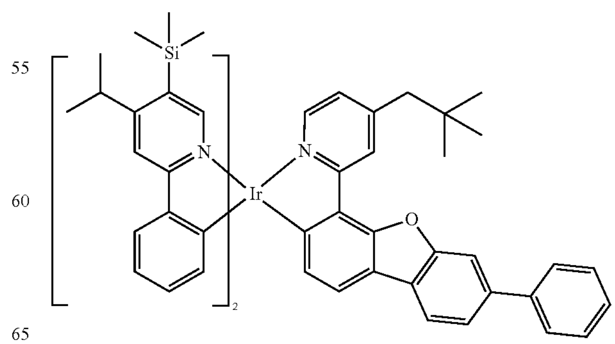

-continued
47
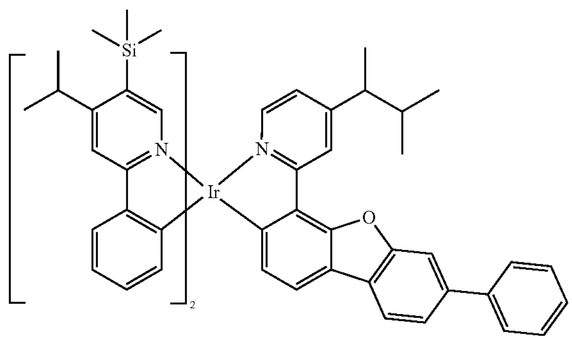
48
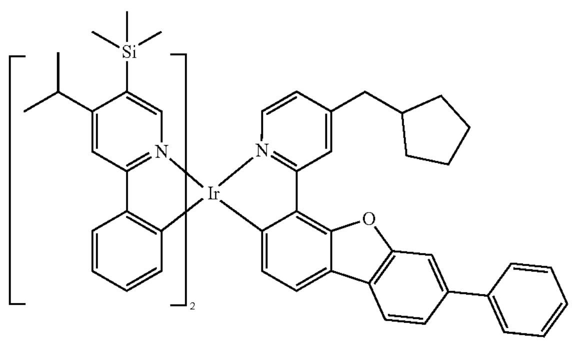
49
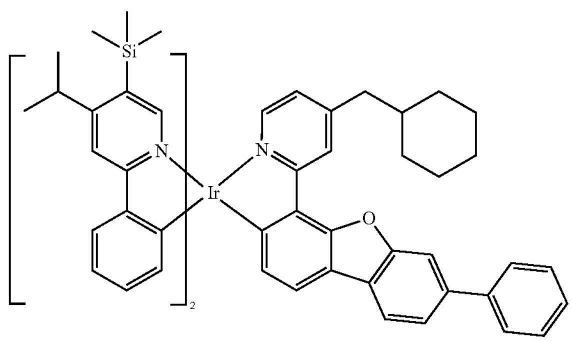
50
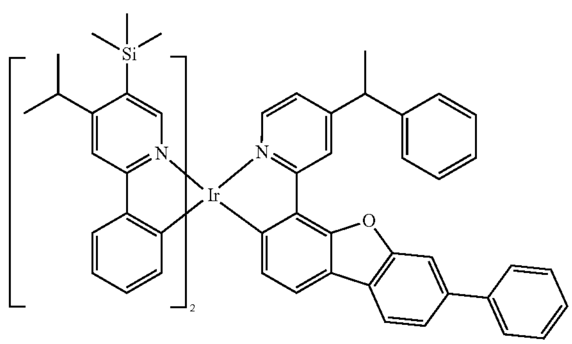
-continued
51
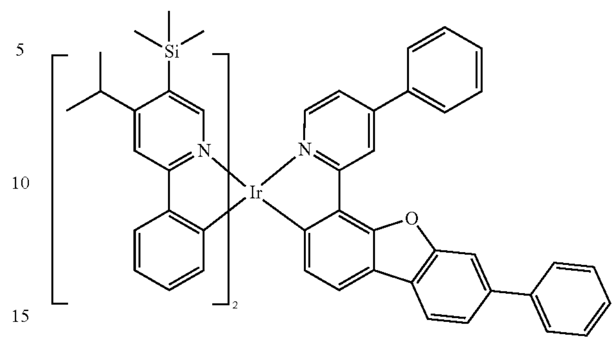
52
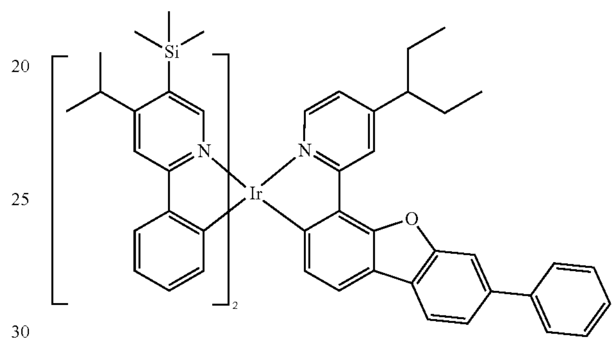
53
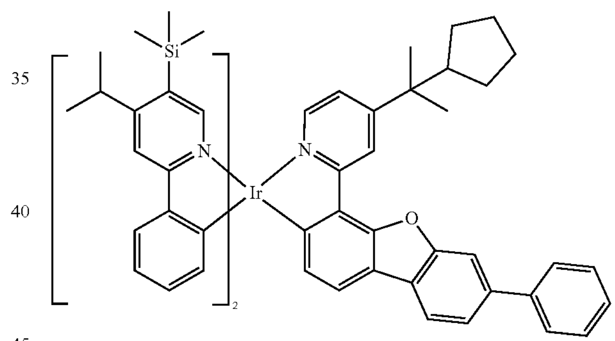
54
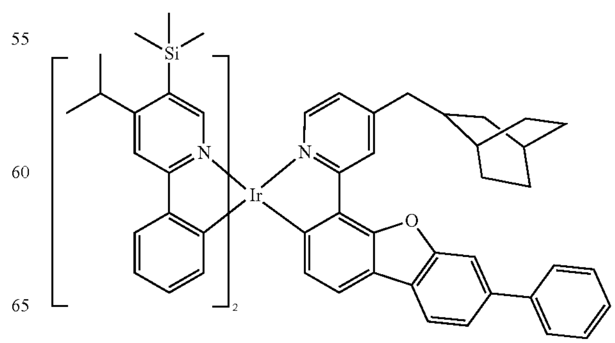

55
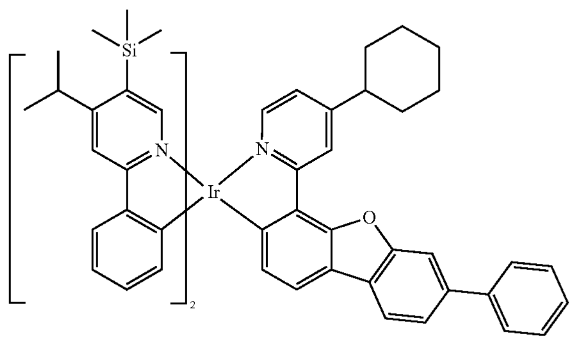
56
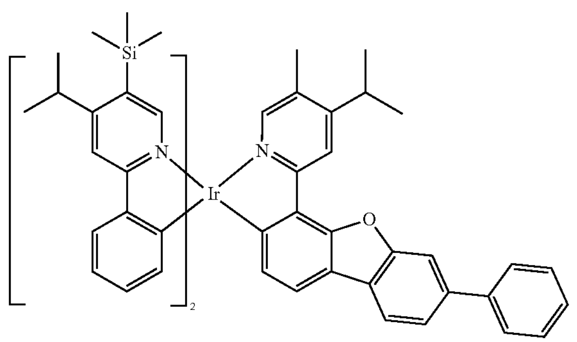
57
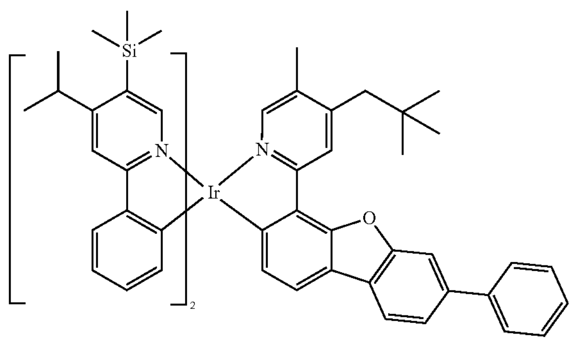
58
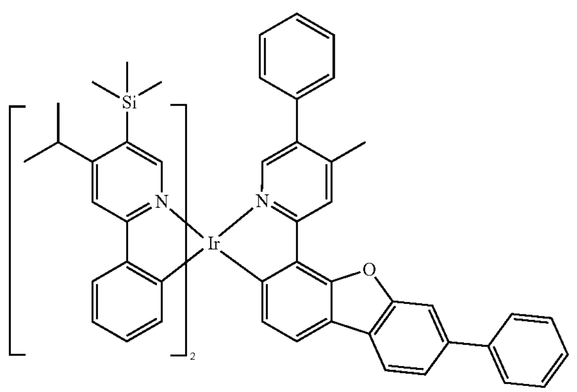
59
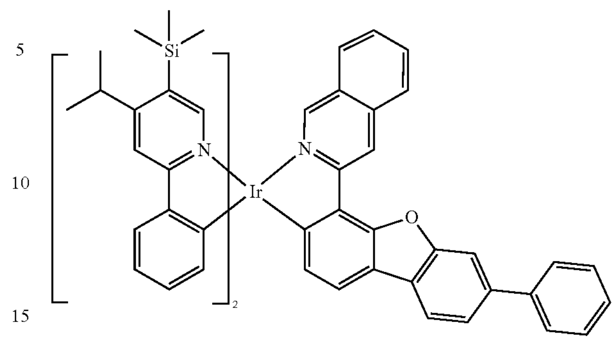
60
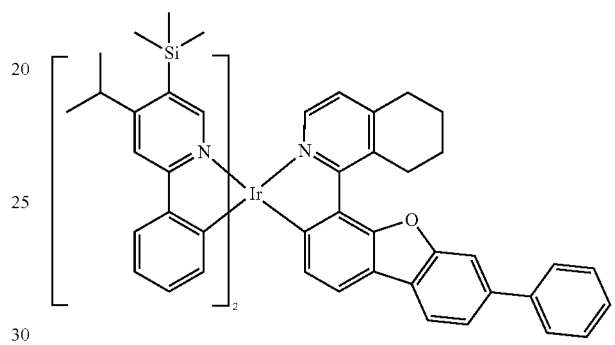
61
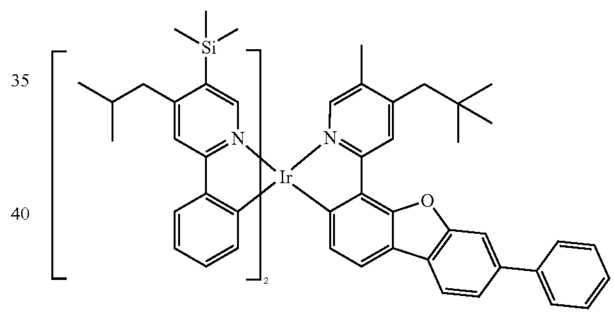
62
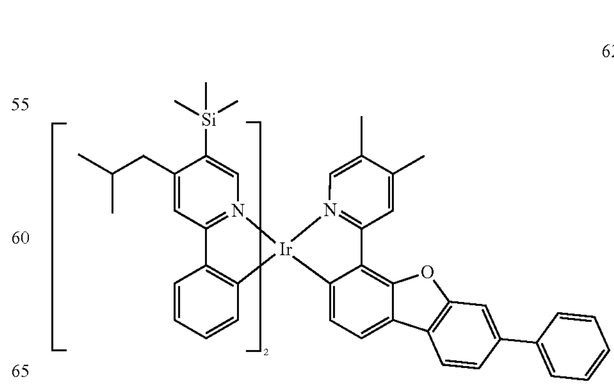

-continued
63
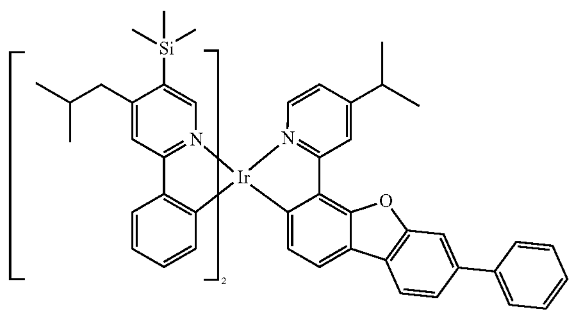
64
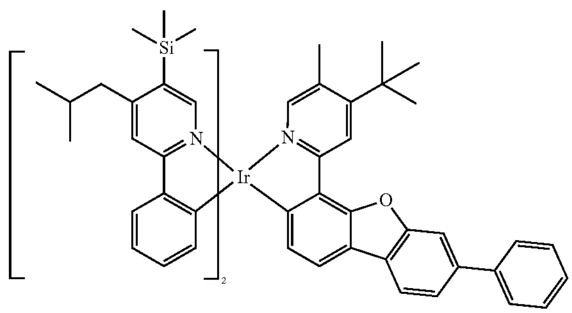
65
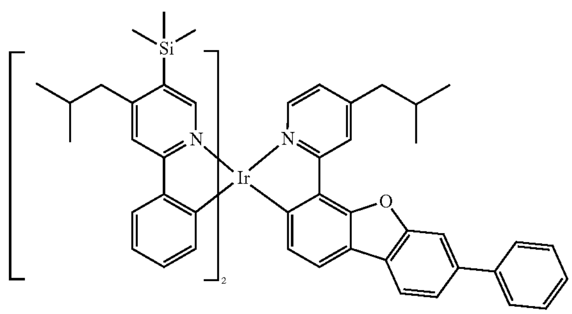
66
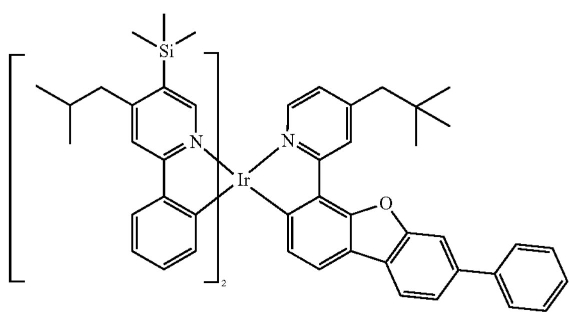
-continued
67
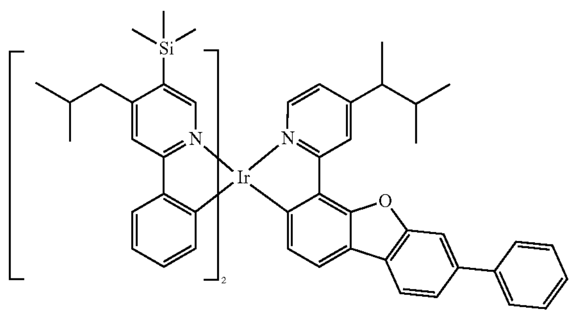
68
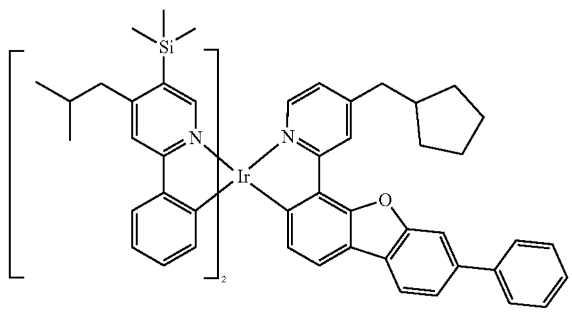
69
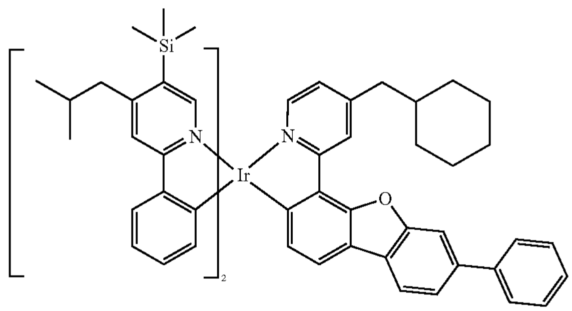
70
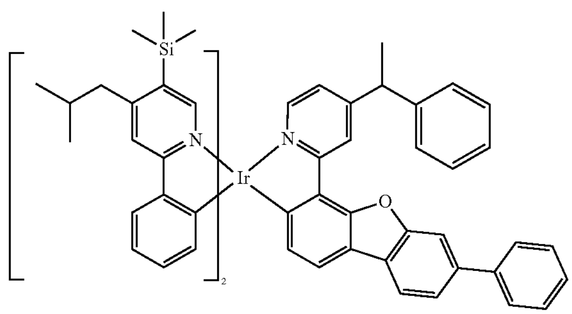

-continued
71
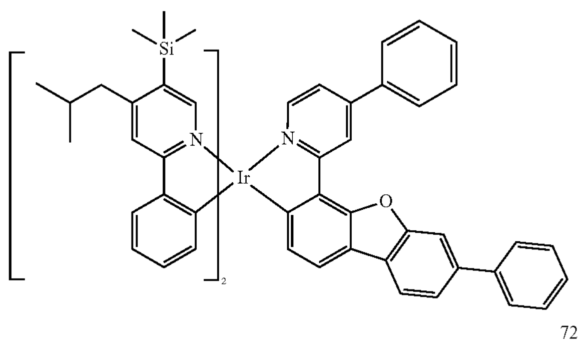
72
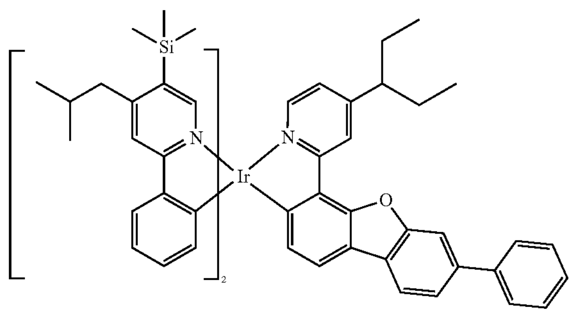
73
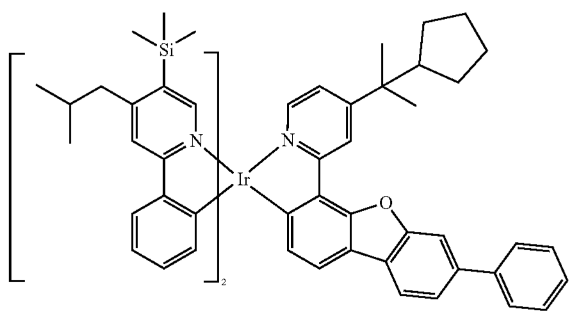
74
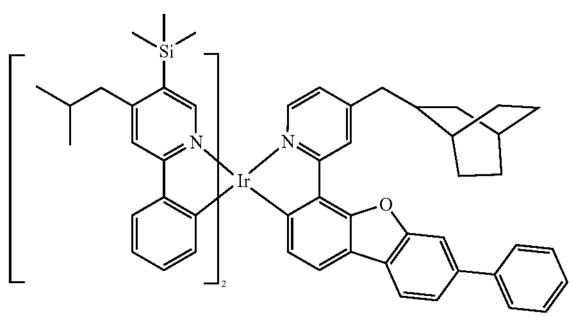
-continued
75
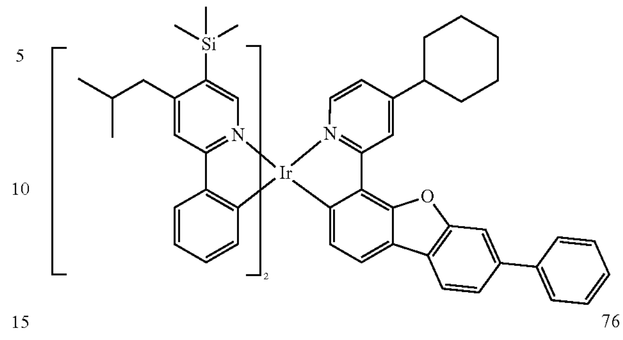
76
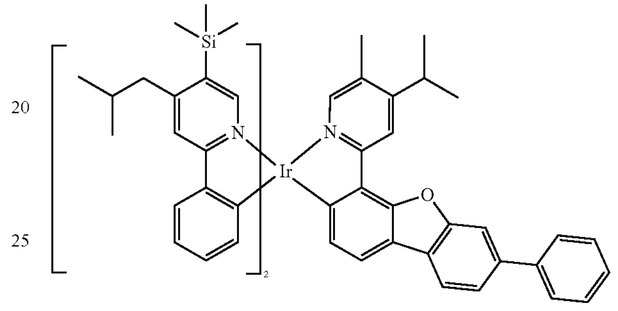
77
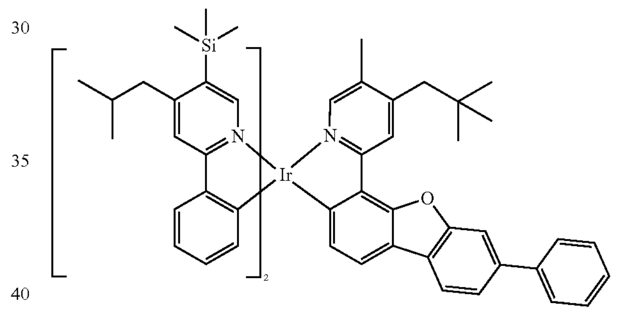
78
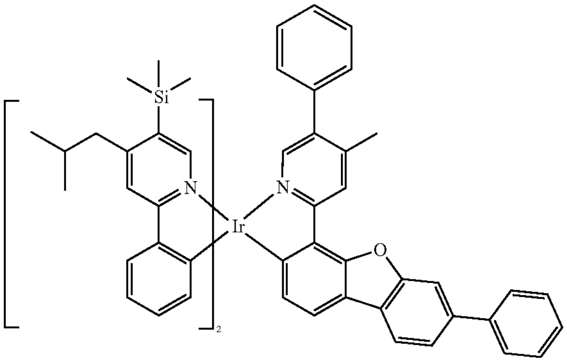

-continued
79
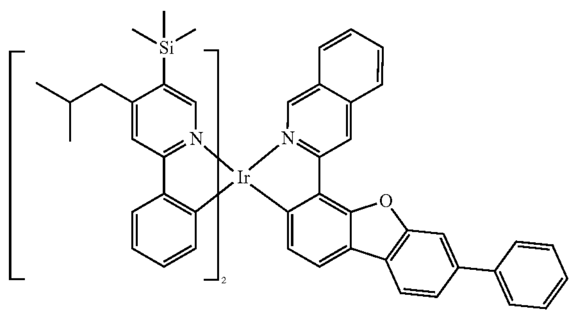
80
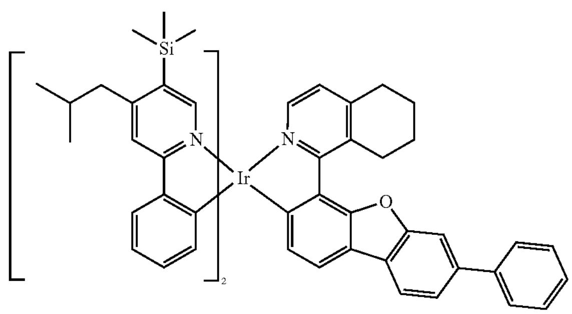
81
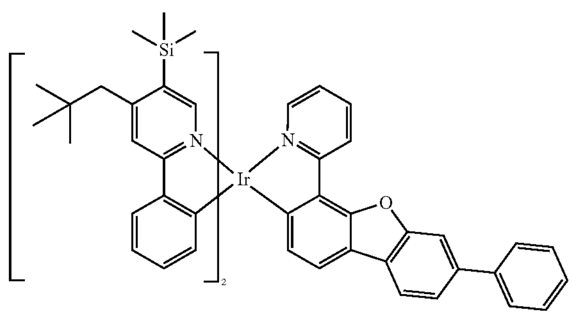
82
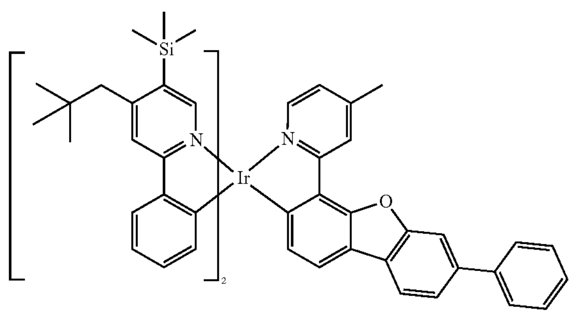
-continued
83
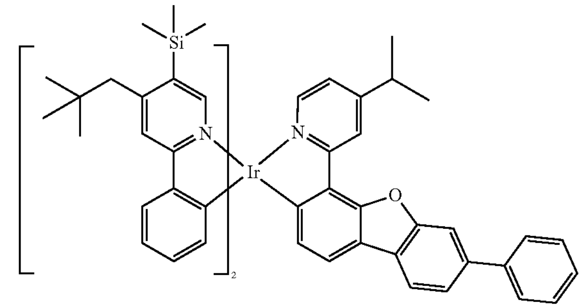
84
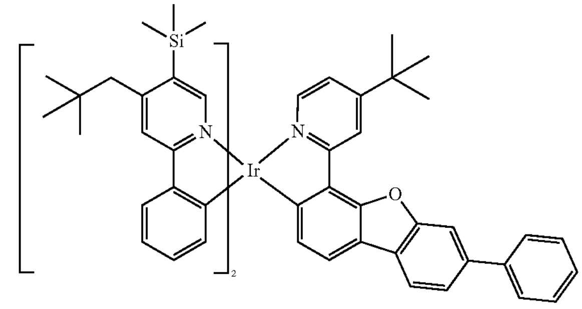
85
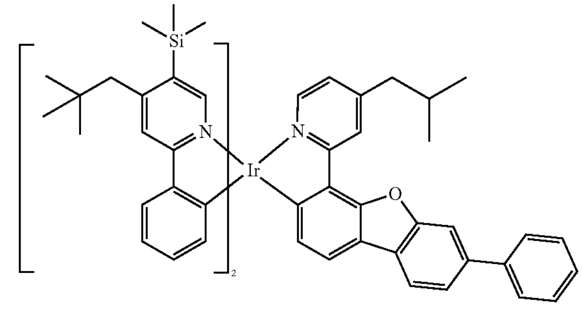
86
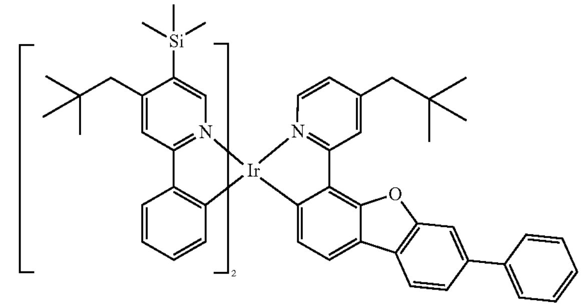

-continued
87
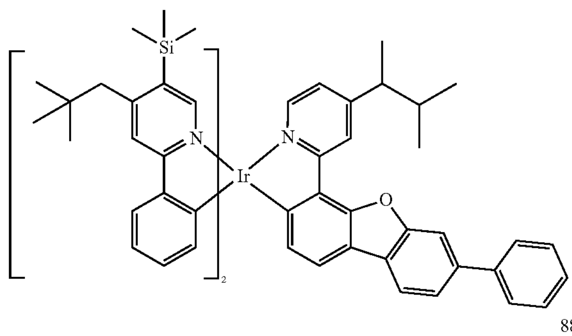
88
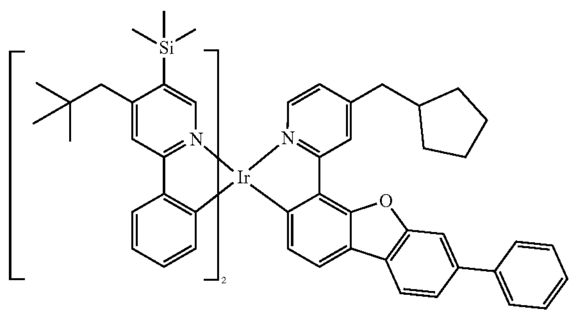
89
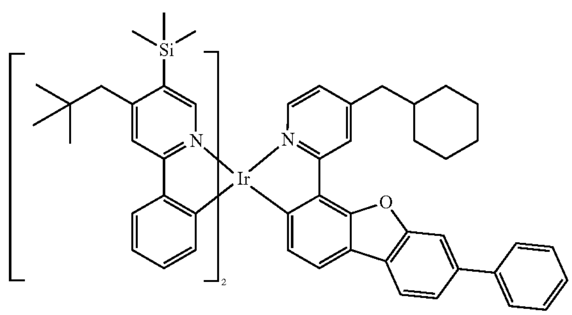
90
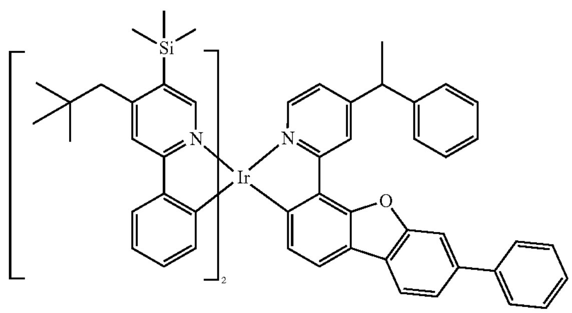
-continued
91
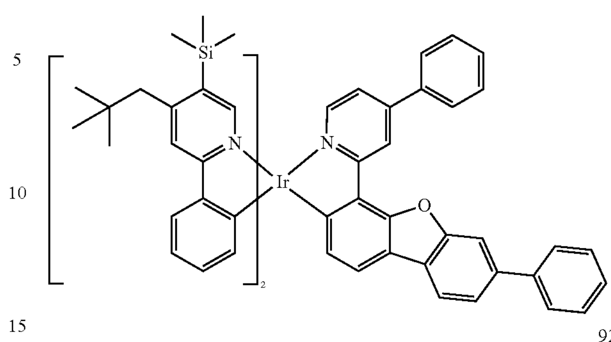
92
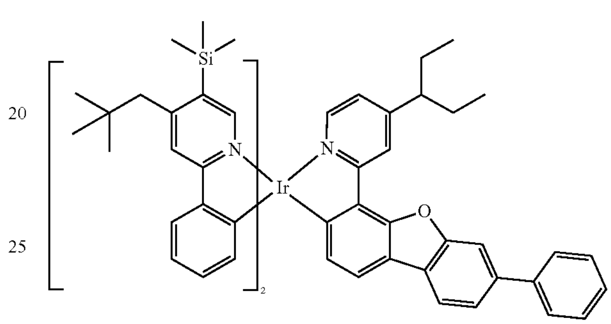
93
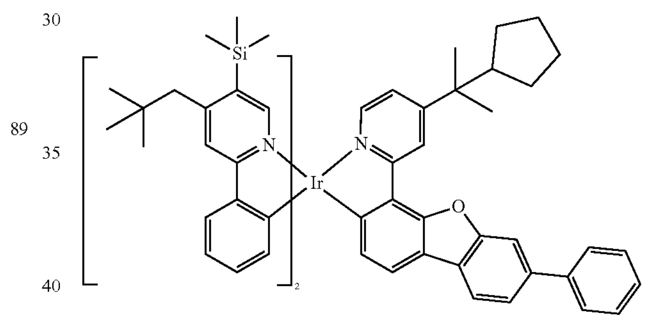
94
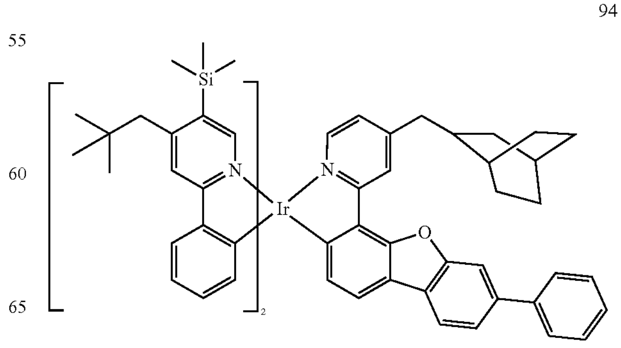

-continued
95
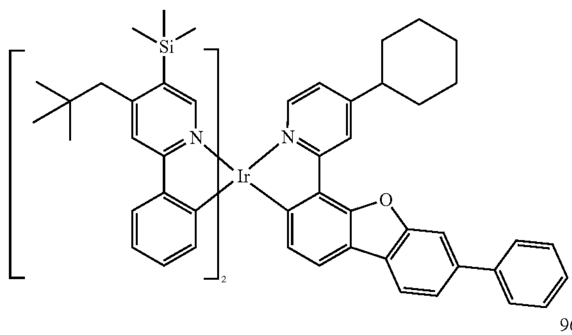
96
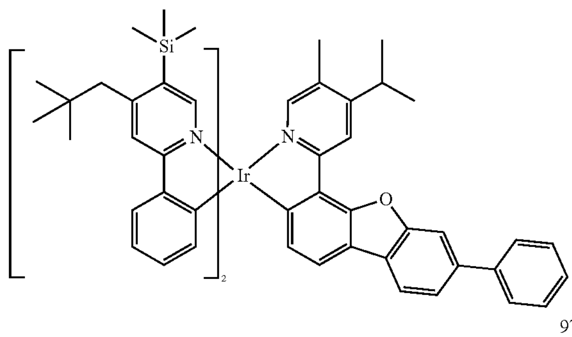
97
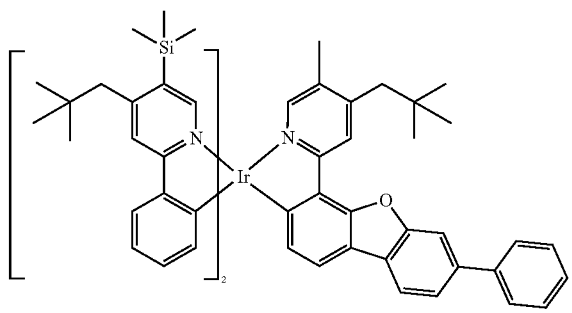
98
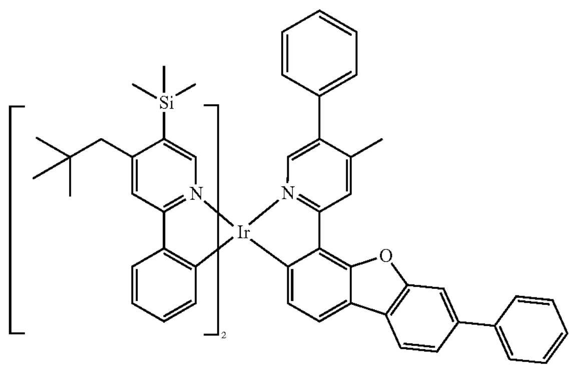
-continued
99
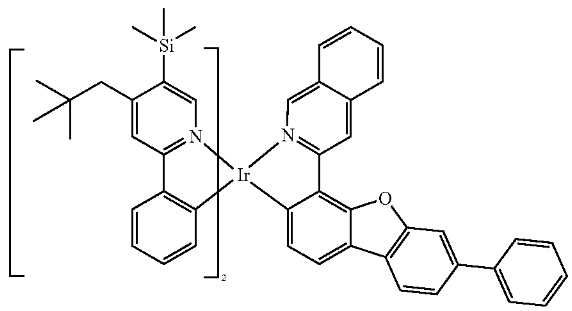
100
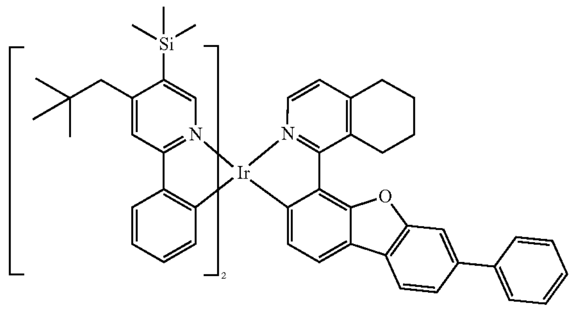
101
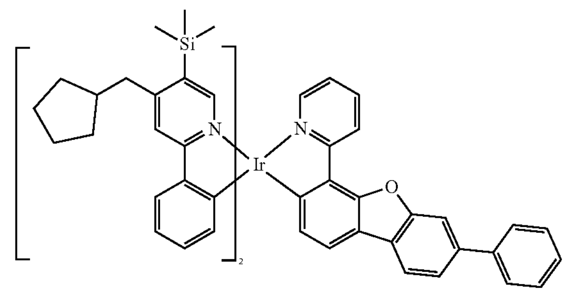
102
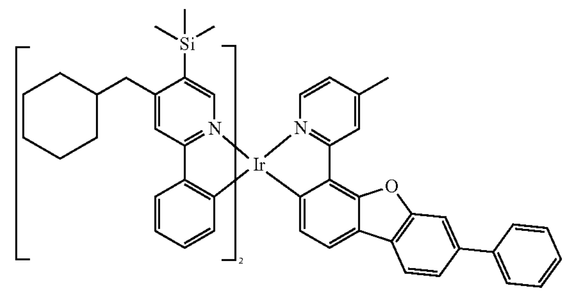
103
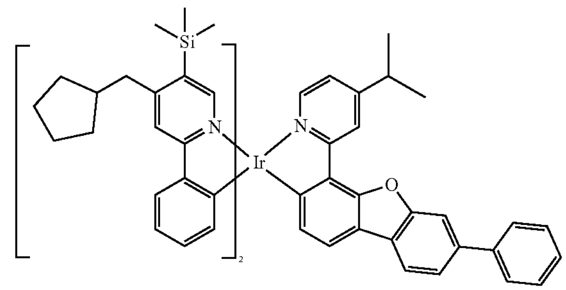

-continued
104
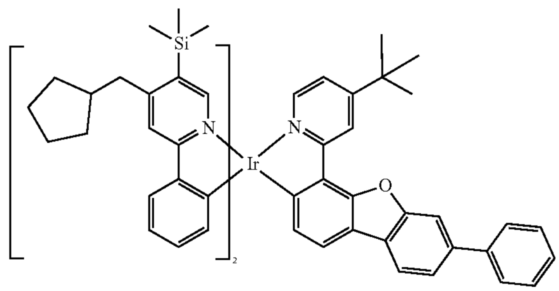
105
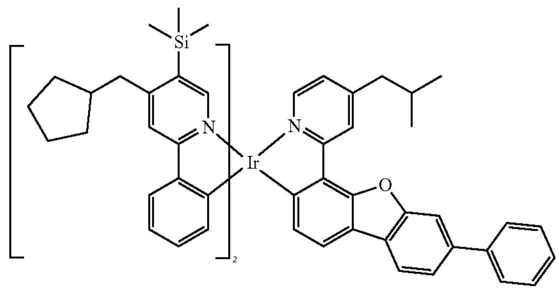
106
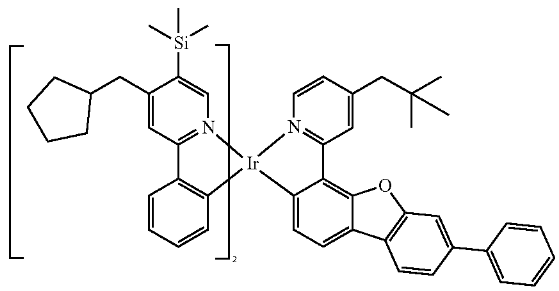
107
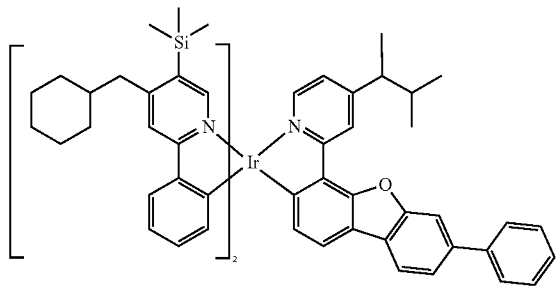
108
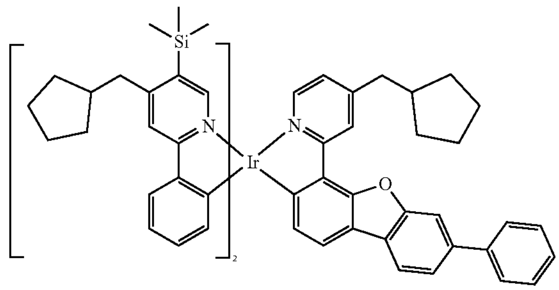
-continued
109
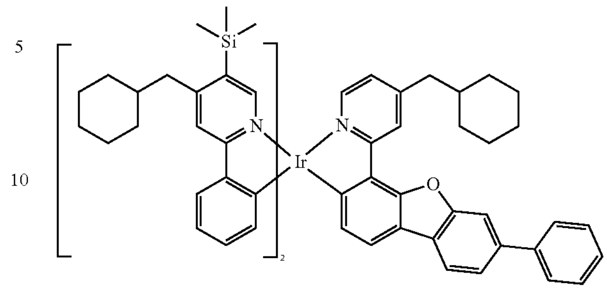
110
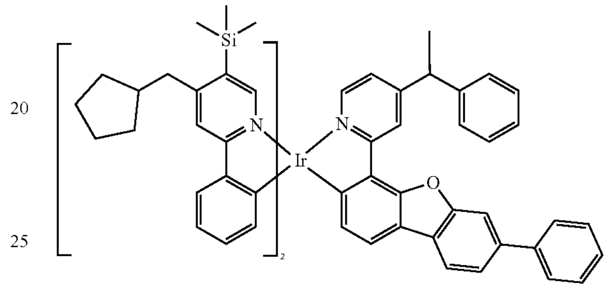
111
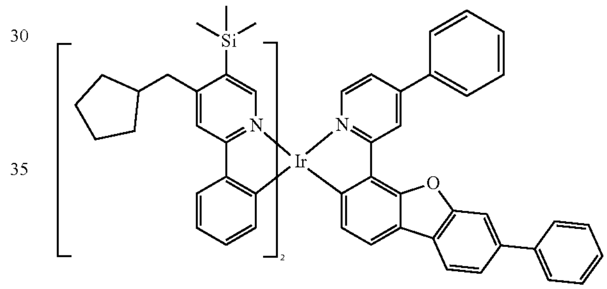
112
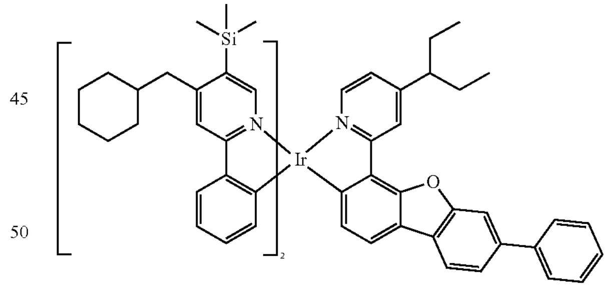
113
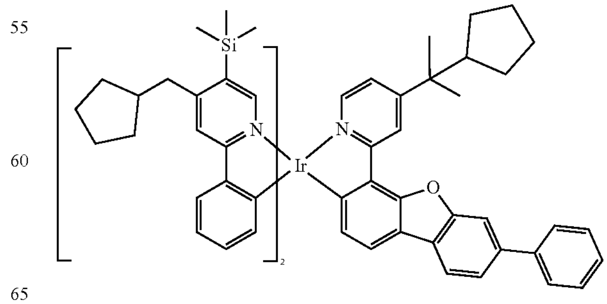

-continued
114
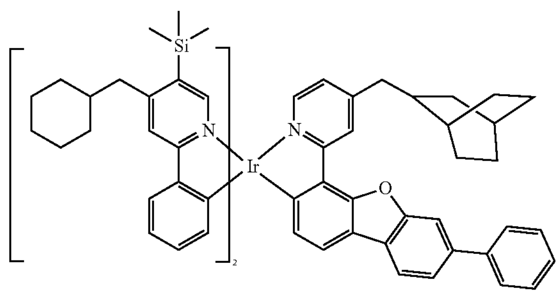
115
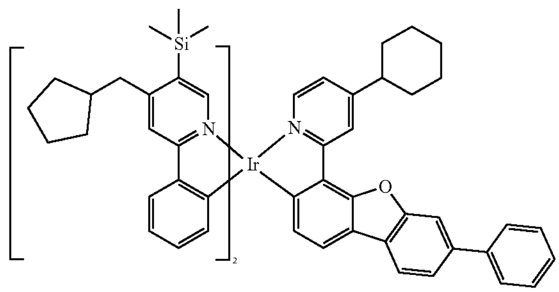
116
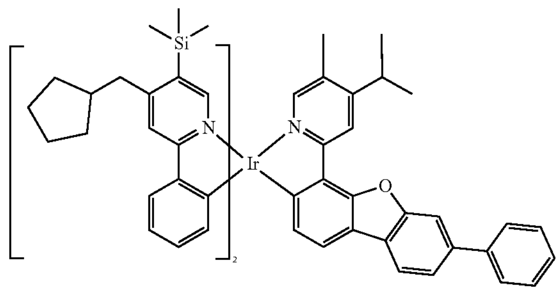
117
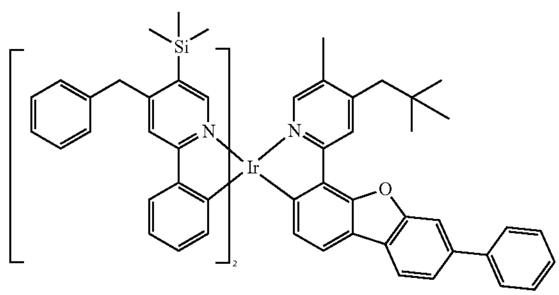
118
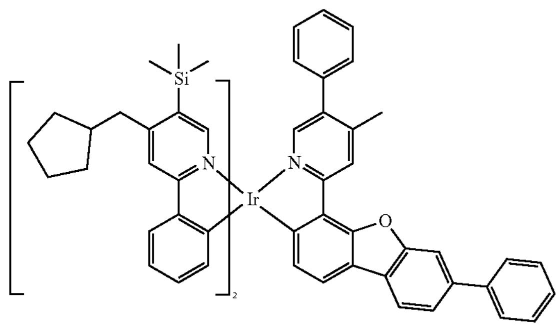
-continued
119
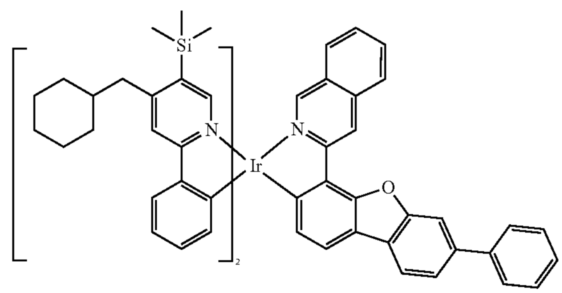
120
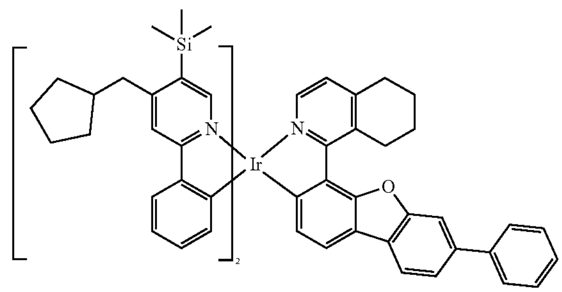
121
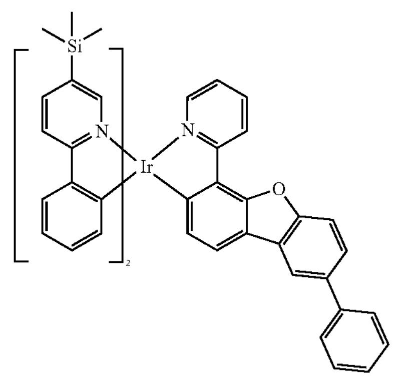
122
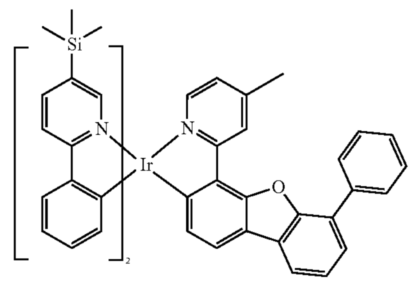

-continued
123
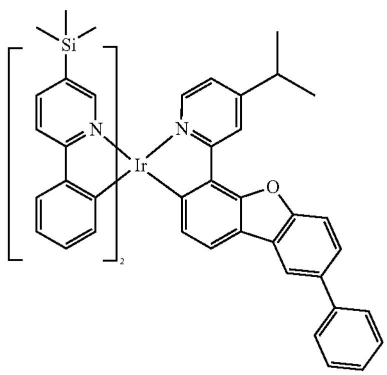
124
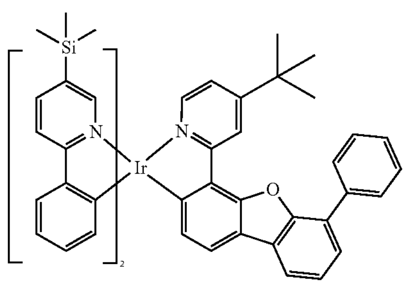
125
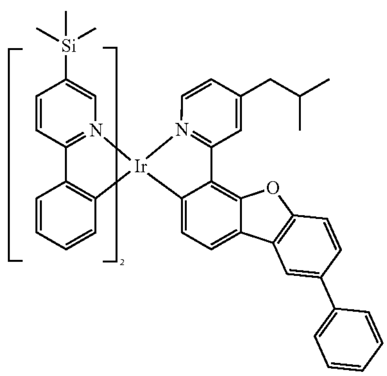
126
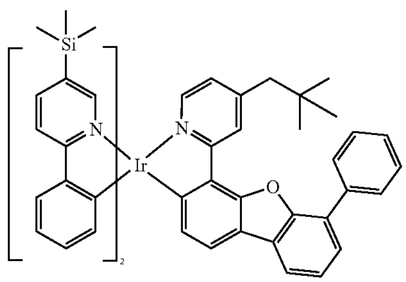
-continued
127
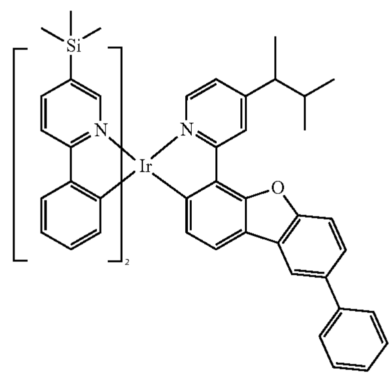
128
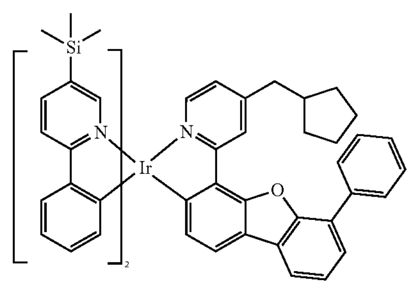
129
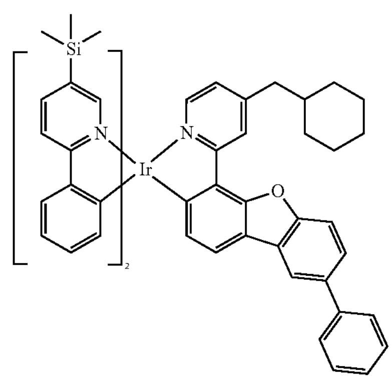
130
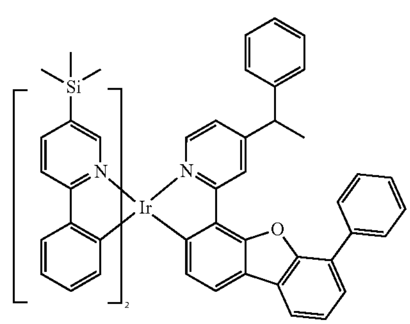

-continued
131
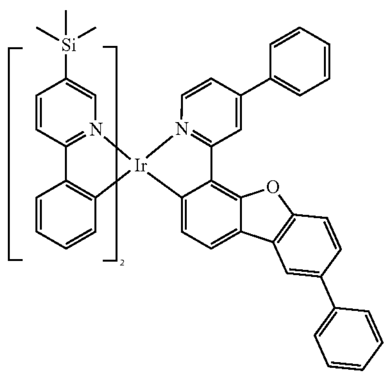
132
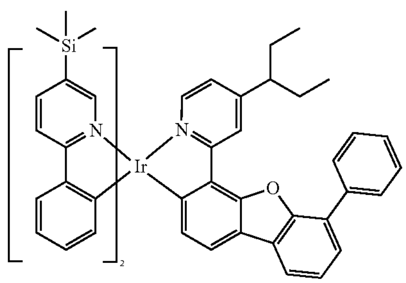
133
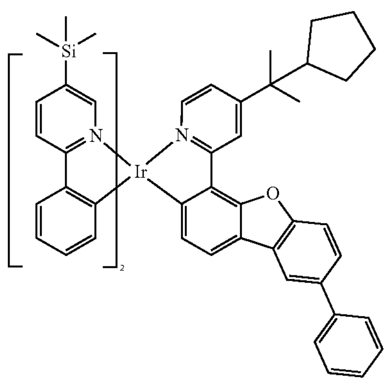
134
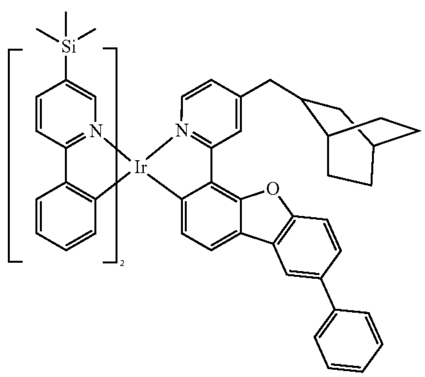
-continued
135
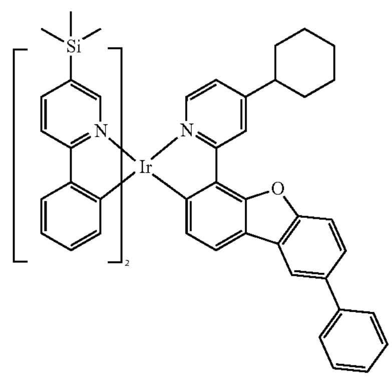
136
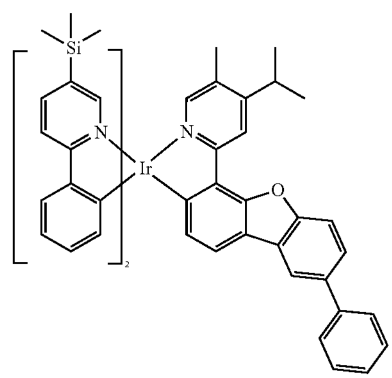
137
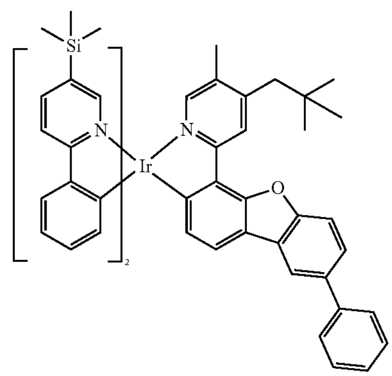
138
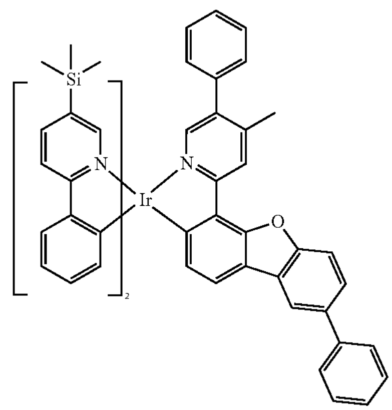

-continued
139
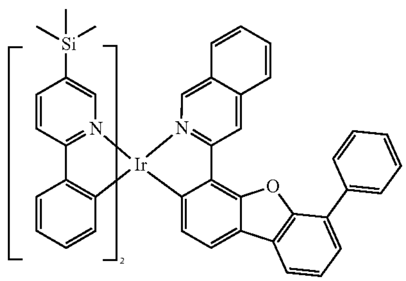
140
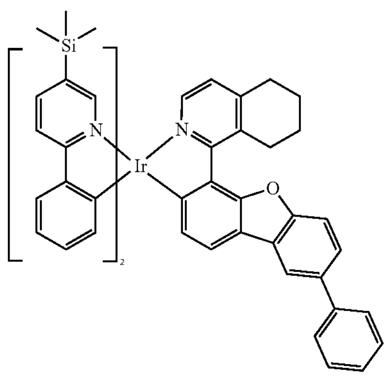
141
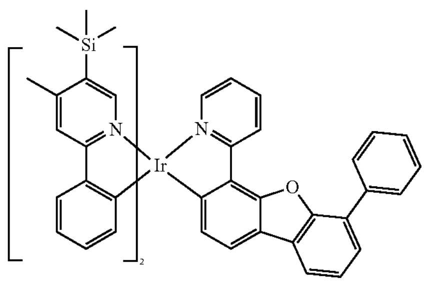
142
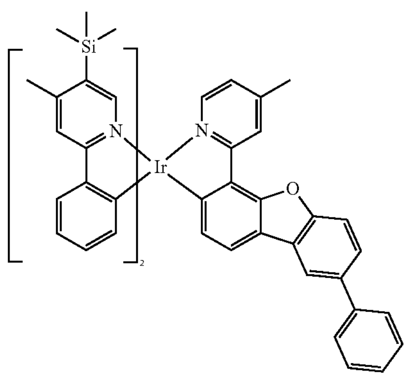
143
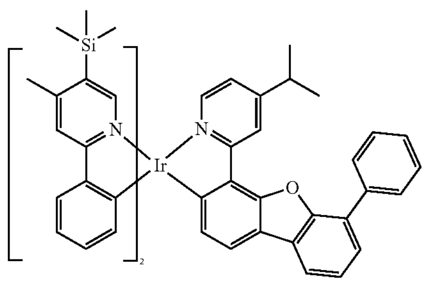
-continued
144
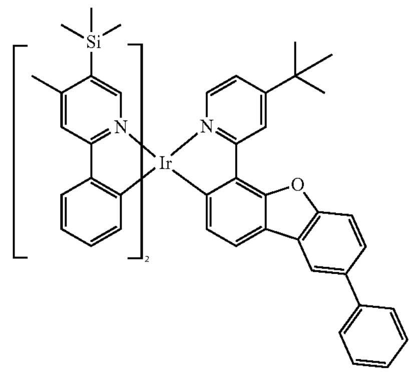
145
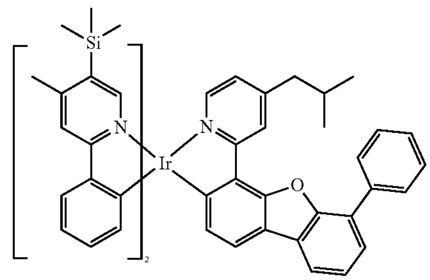
156
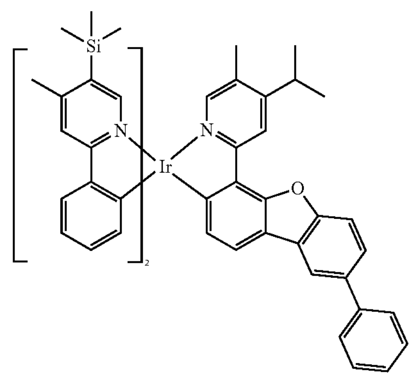
157
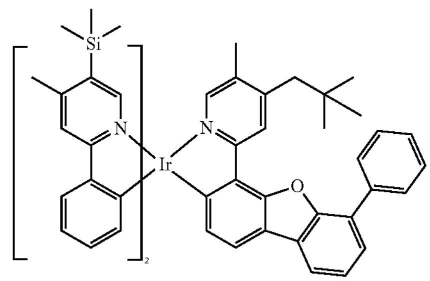

-continued
158
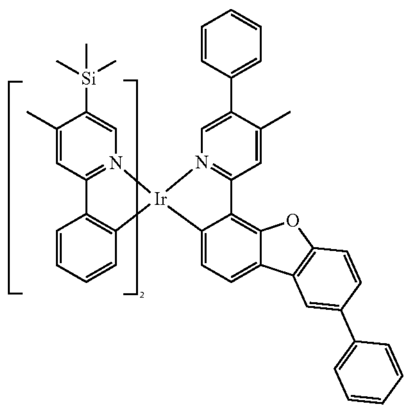
159
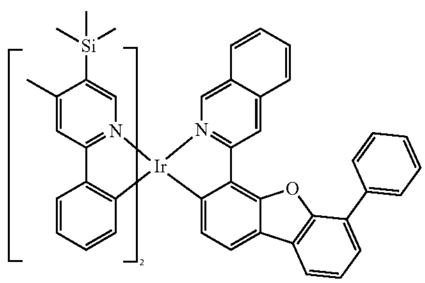
160
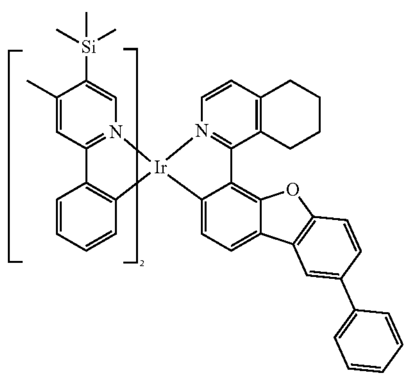
161
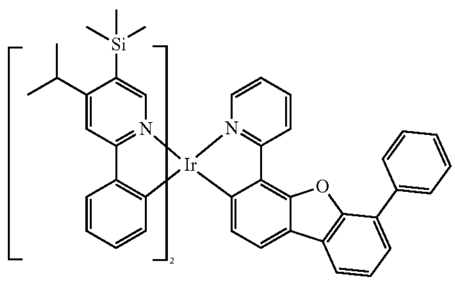
-continued
162
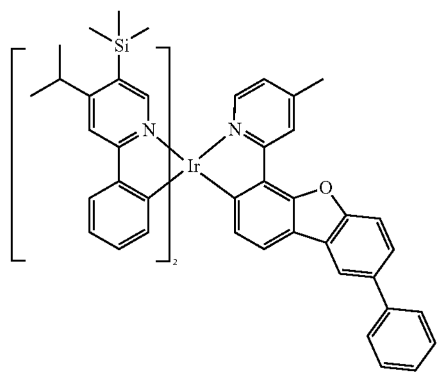
163
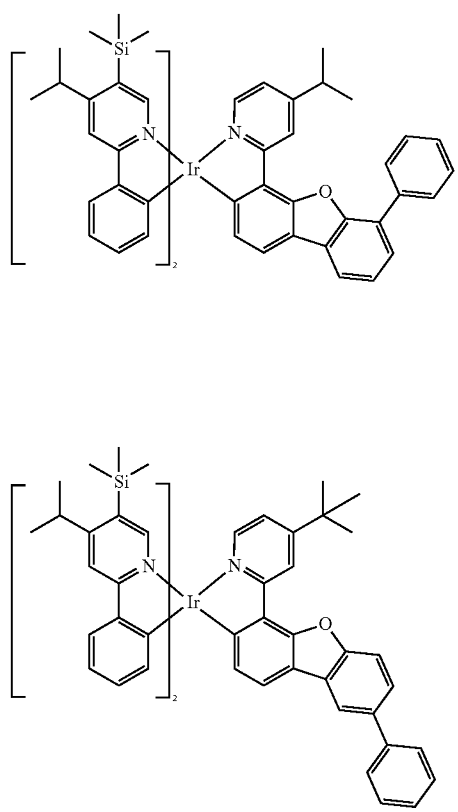
164
165
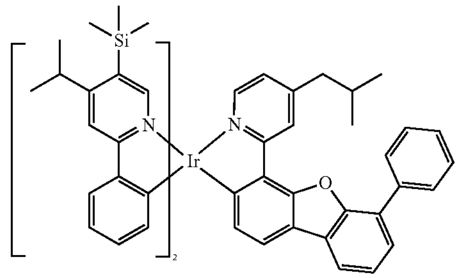

-continued
166
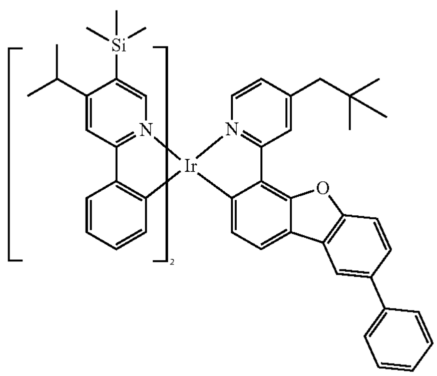
167
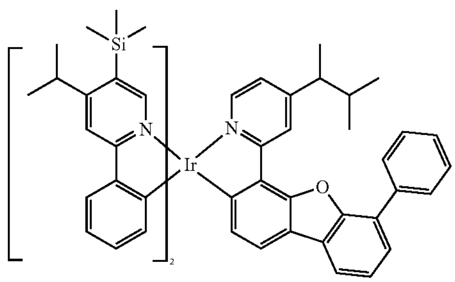
168
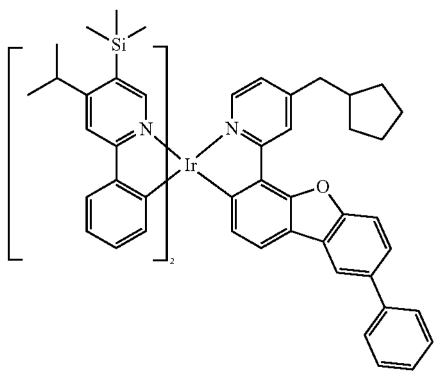
169
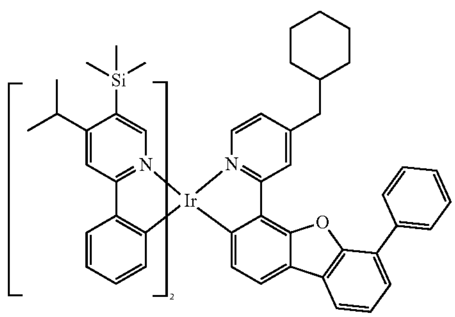
-continued
170
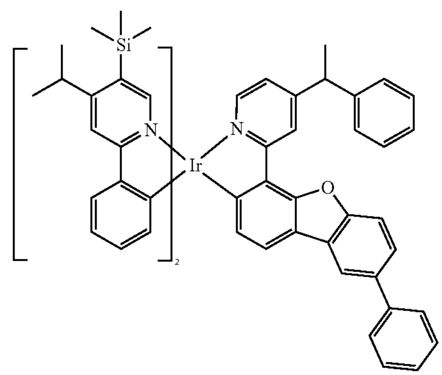
171
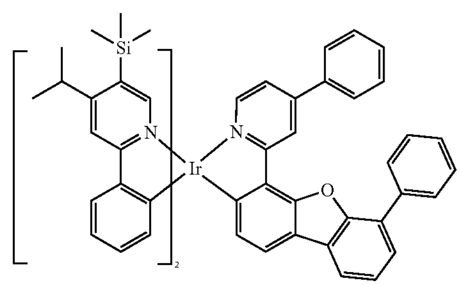
172
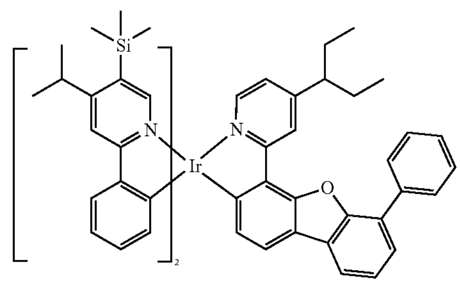
173
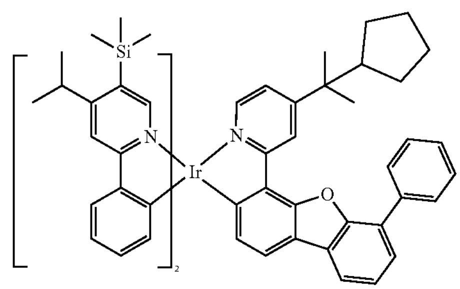
174
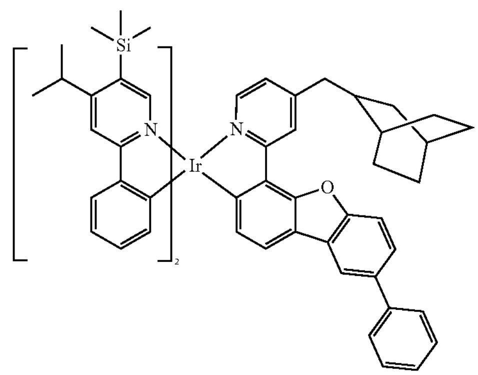

-continued
175
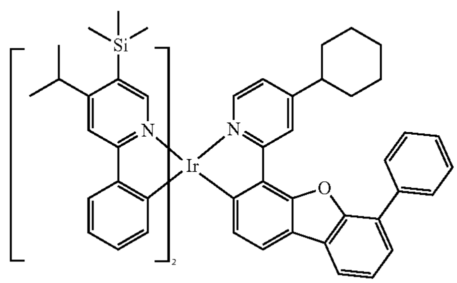
176
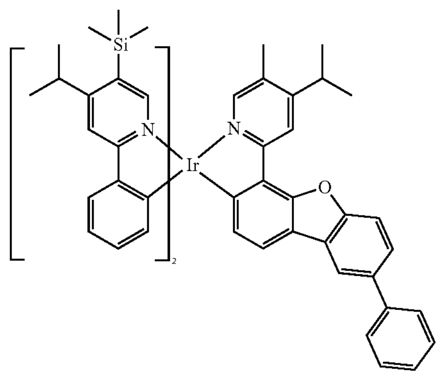
177
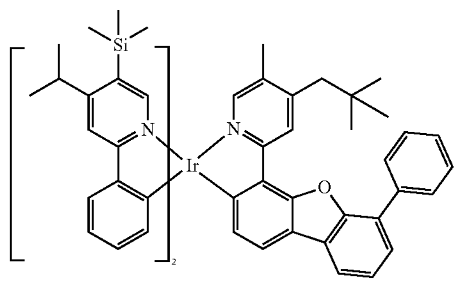
178
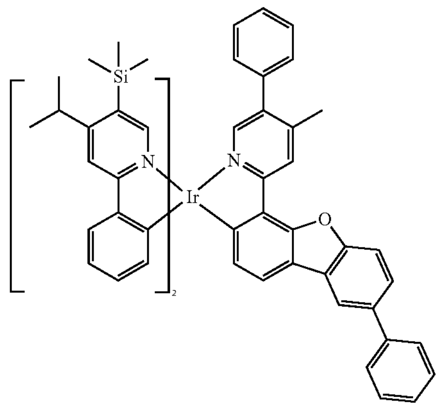
179
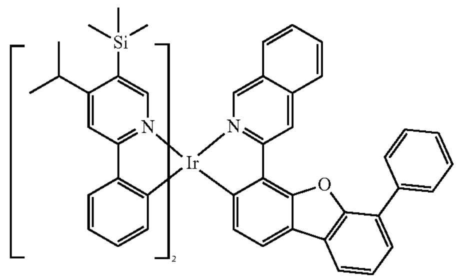
-continued
180
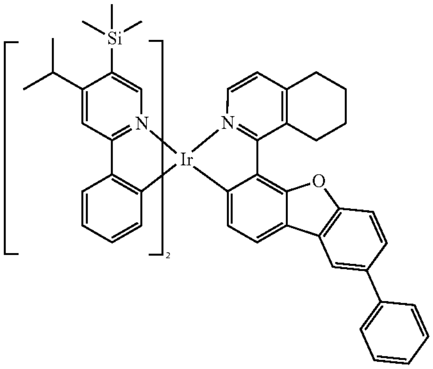
181
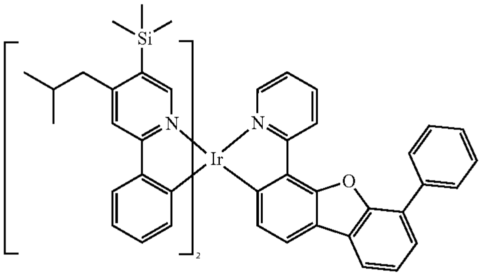
182
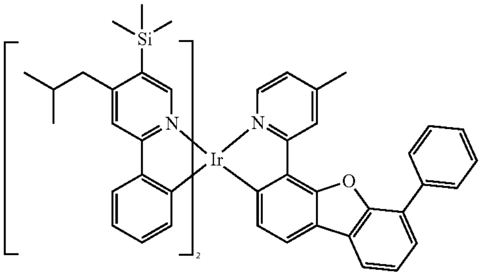
183
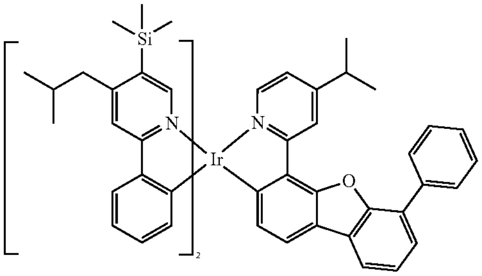
184
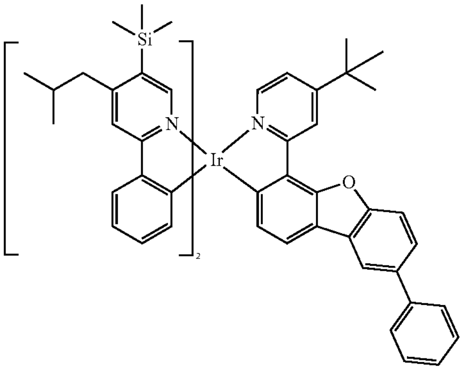

-continued
185
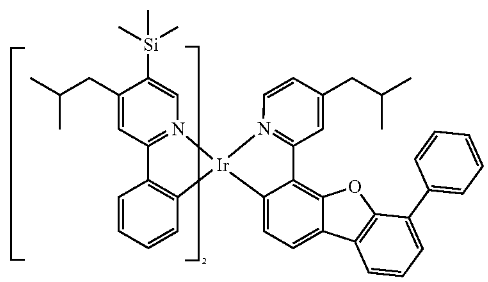
186
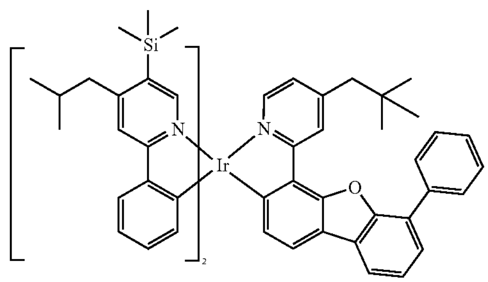
187
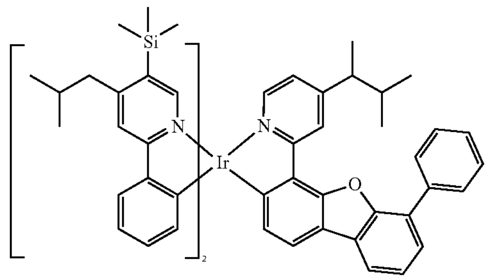
188
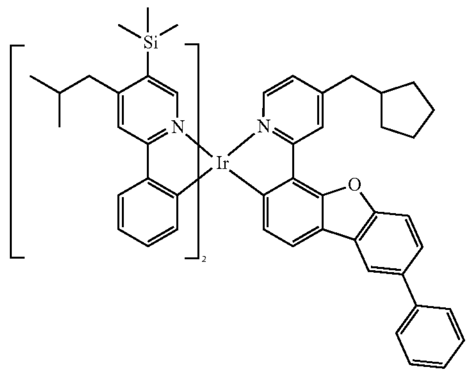
189
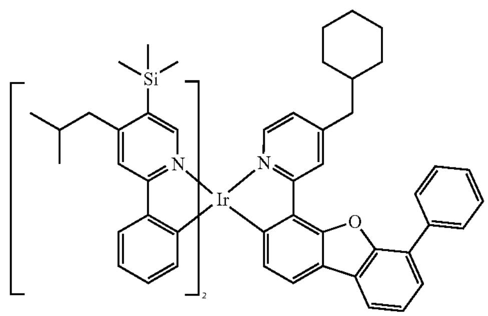
-continued
190
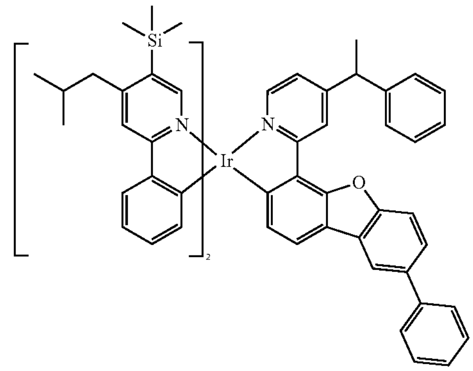
191
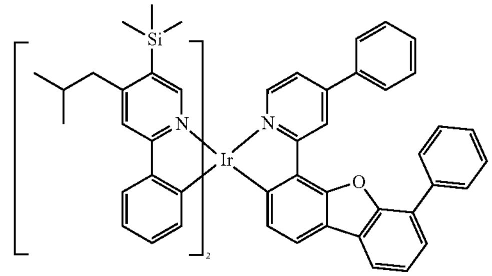
192
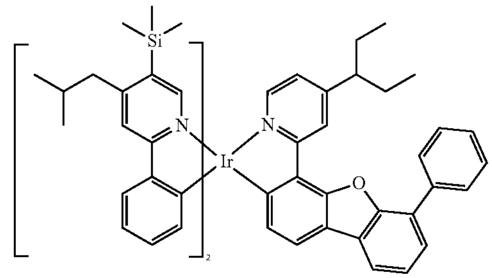
193
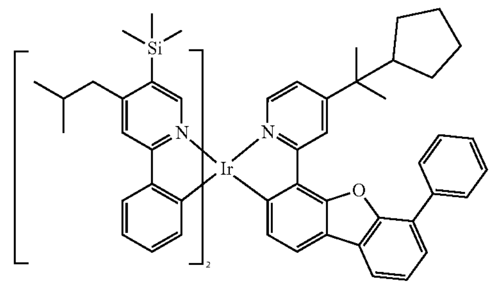
194
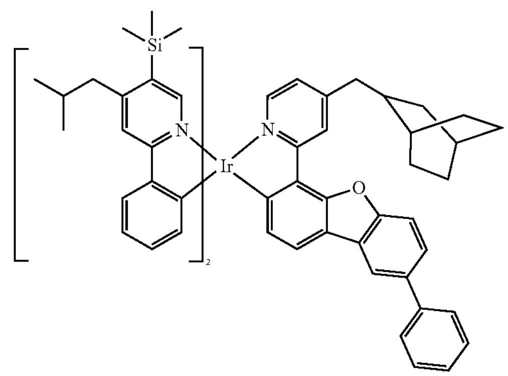

-continued
195
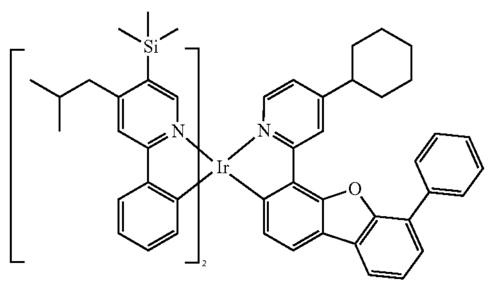
196
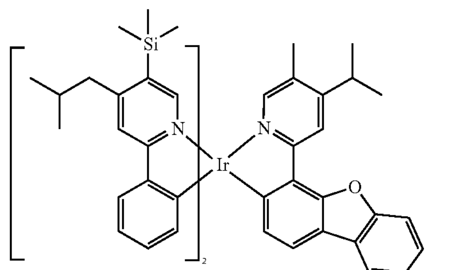
197
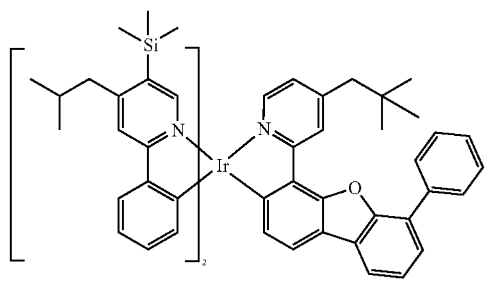
198
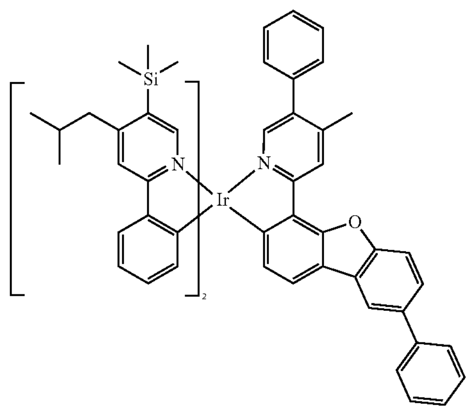
199
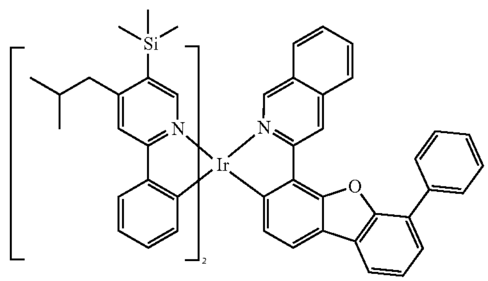
-continued
200
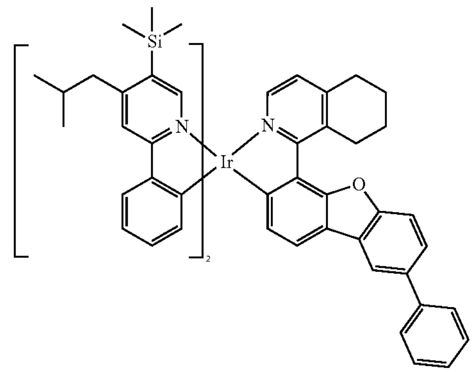
201
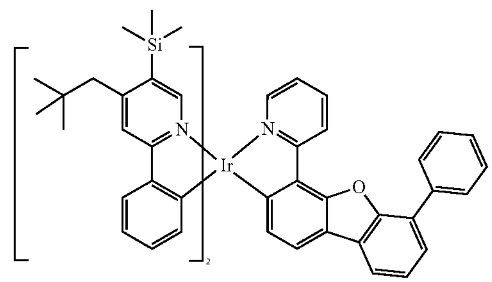
202
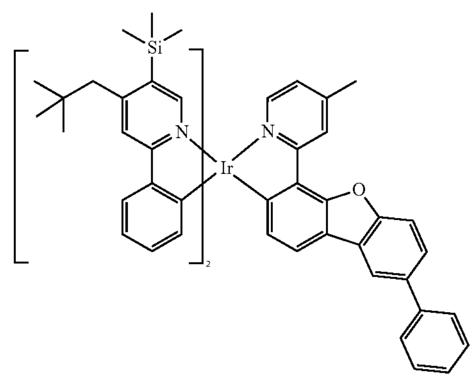
203
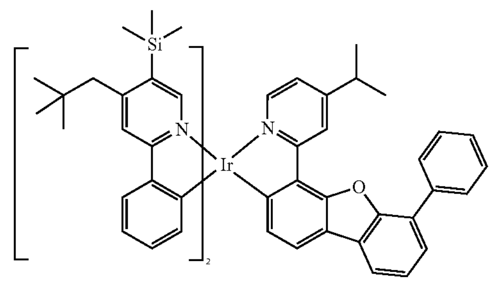

-continued
204
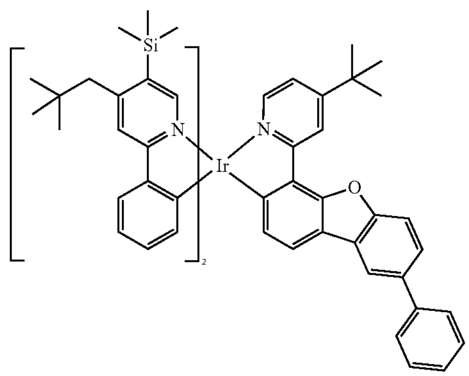
205
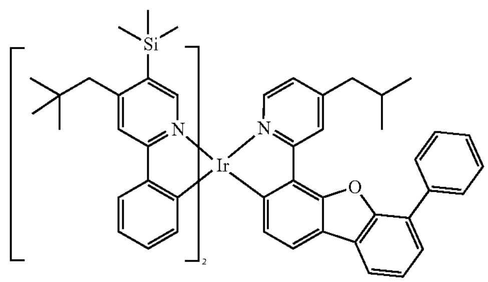
206
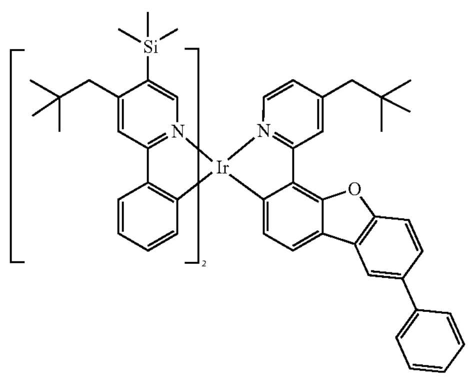
207
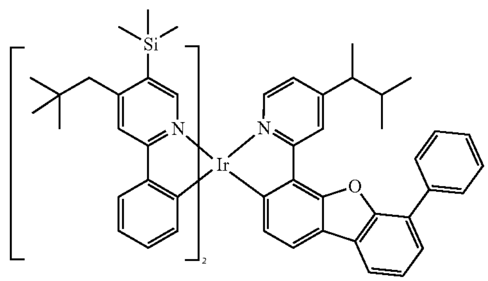
-continued
208
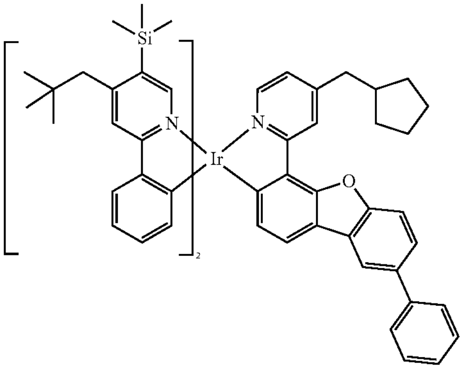
209
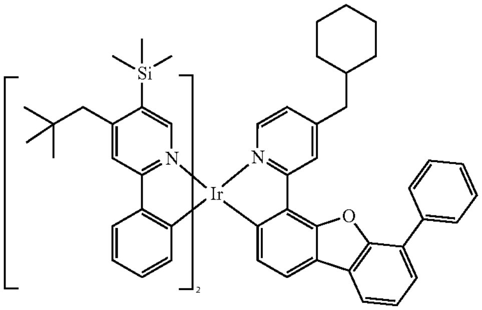
210
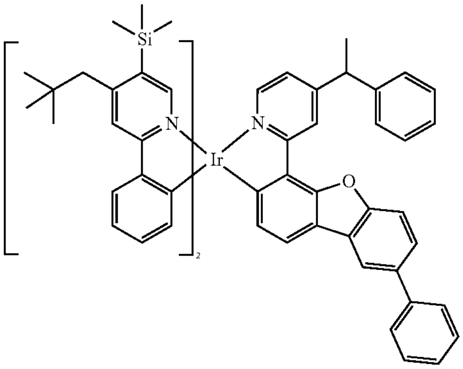
211
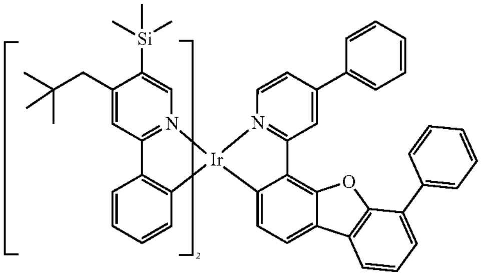

-continued
212
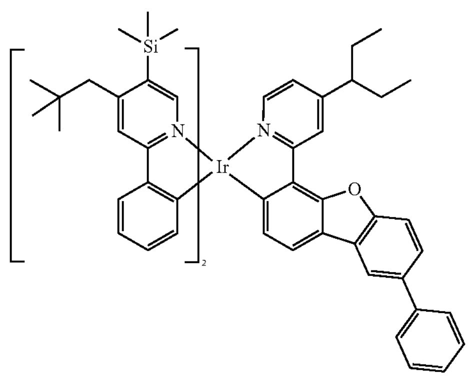
213
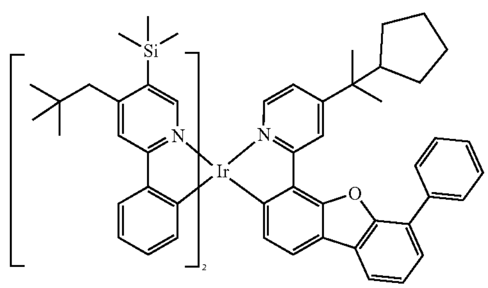
214
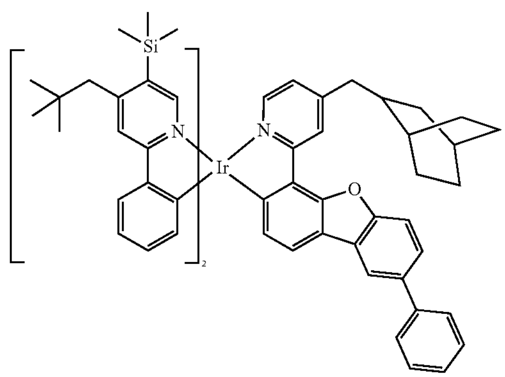
215
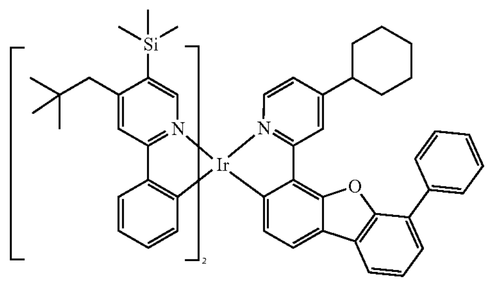
-continued
216
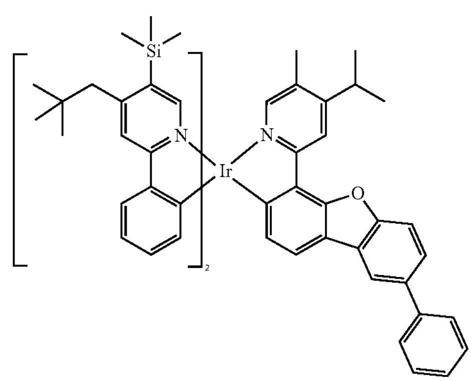
217
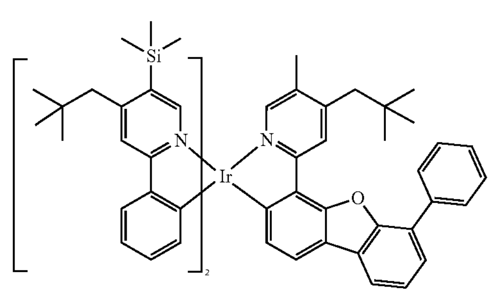
218
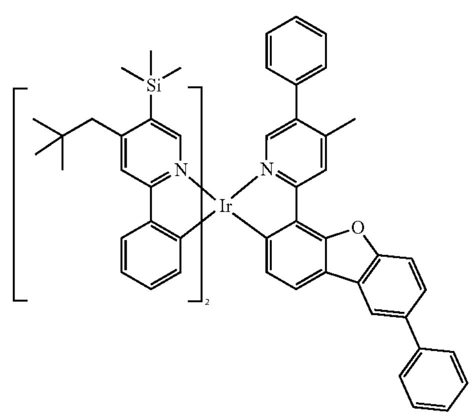
219
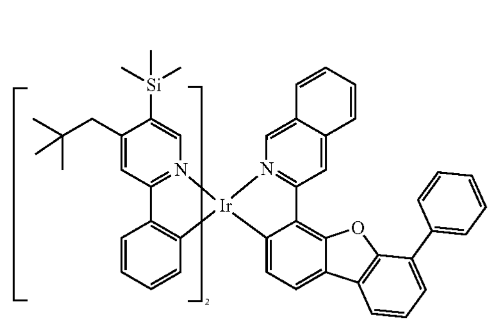

-continued
220
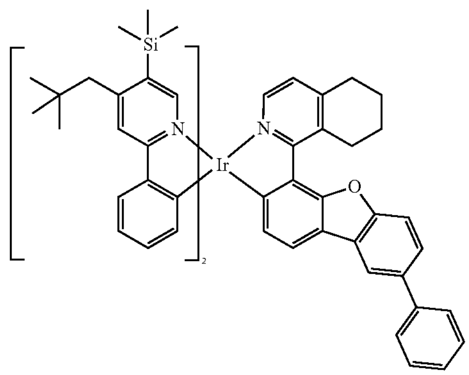
221
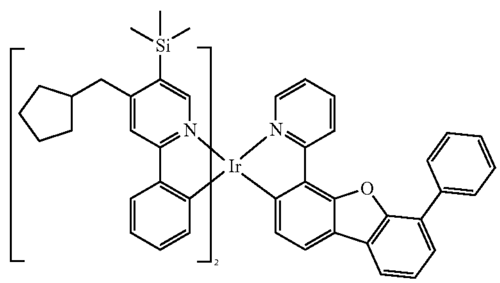
222
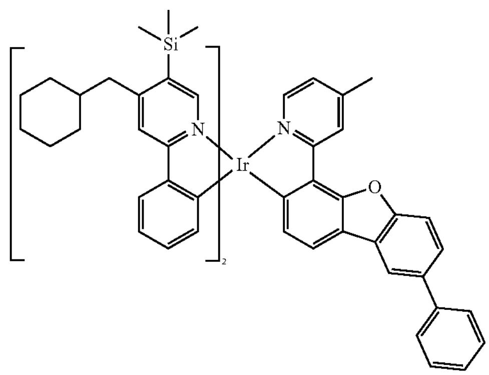
223
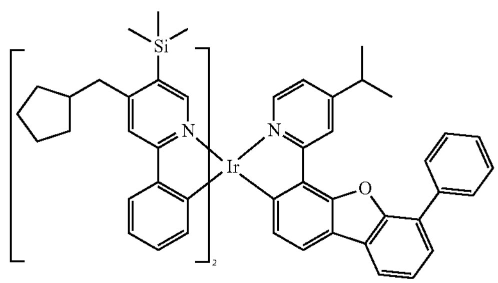
-continued
224
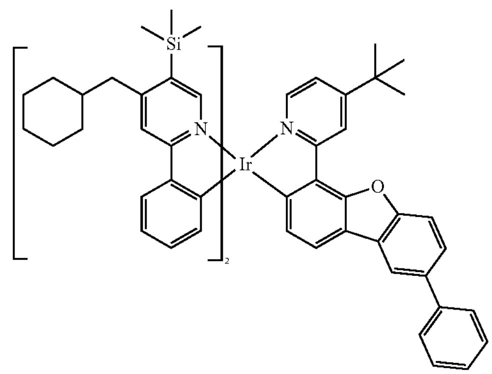
225
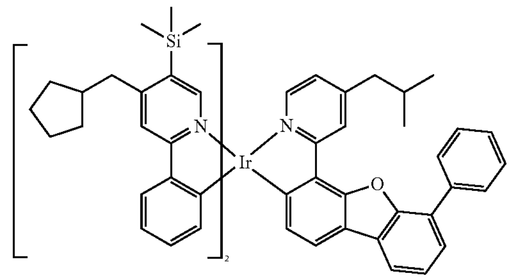
226
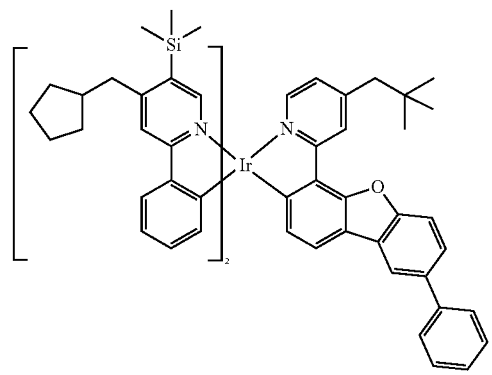
227
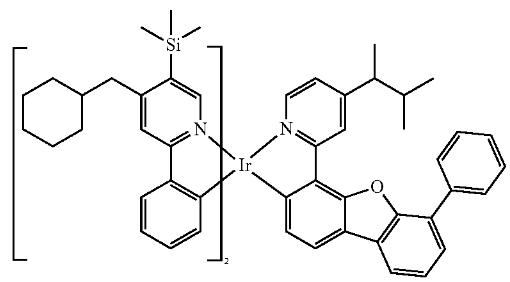

-continued
228
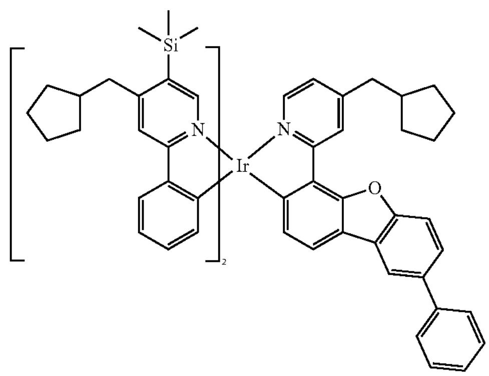
229
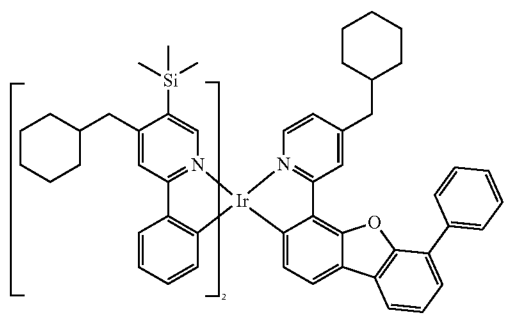
230
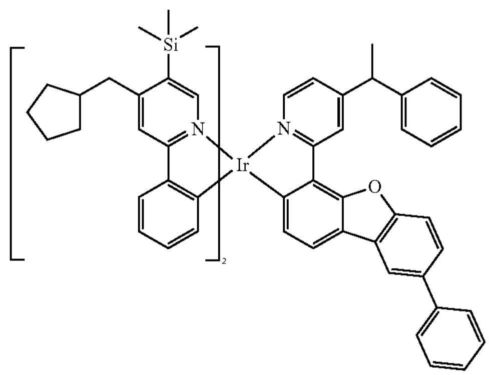
236
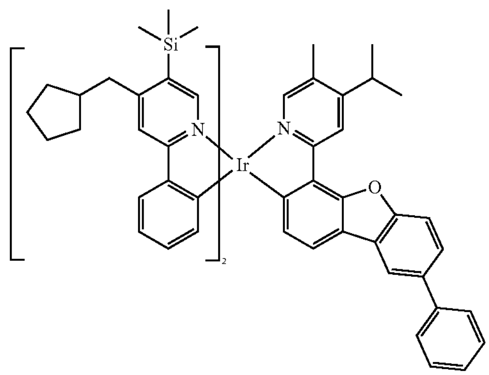
-continued
237
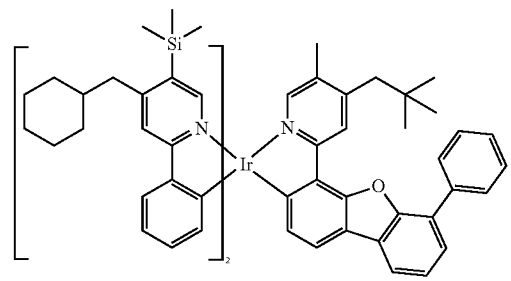
238
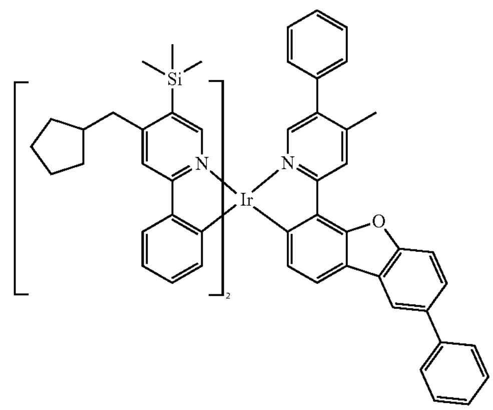
239
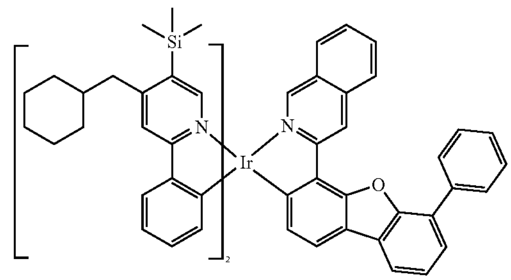
240
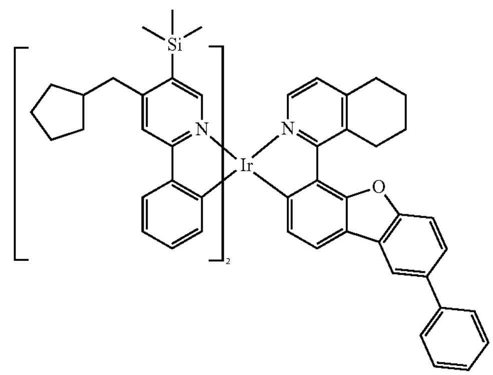

-continued
241
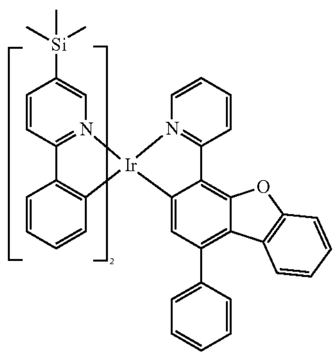
242
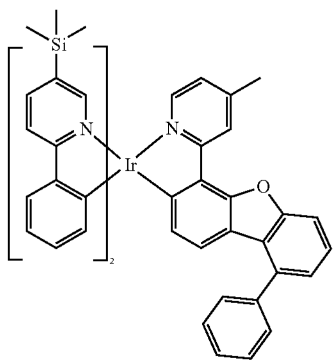
243
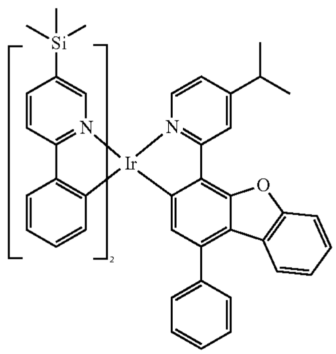
244
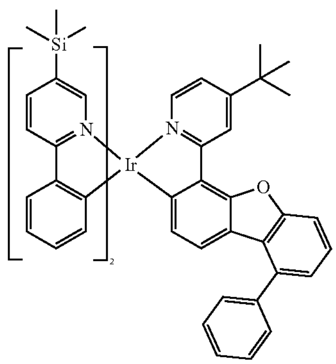
-continued
245
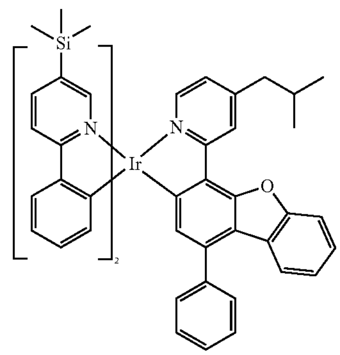
246
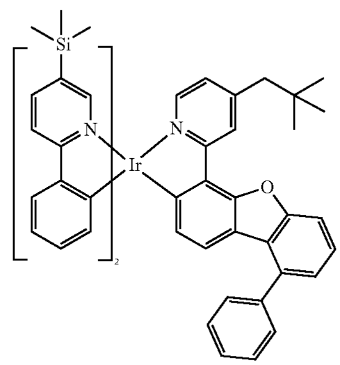
247
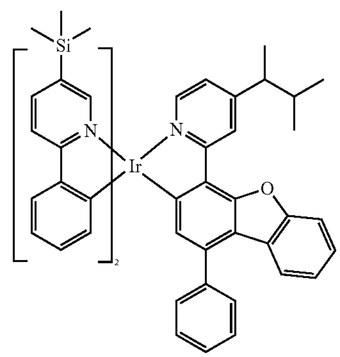
248
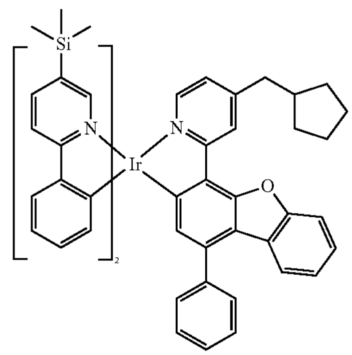

-continued
249
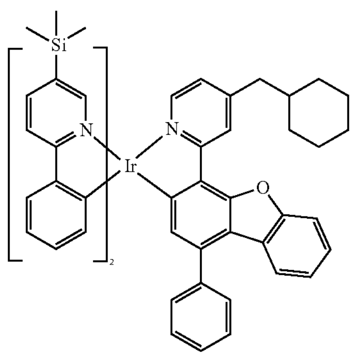
250
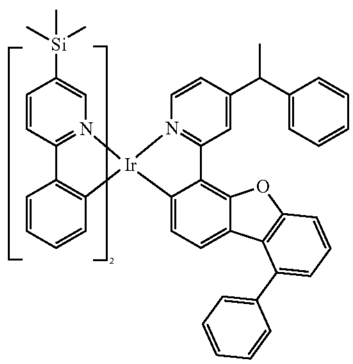
251
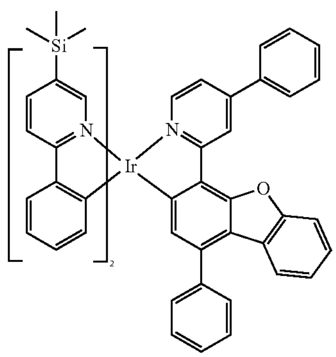
252
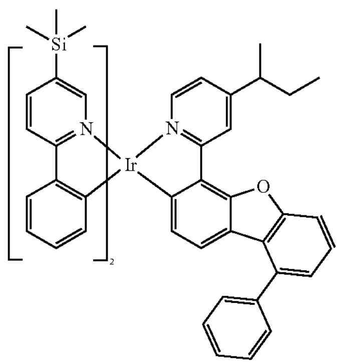
-continued
253
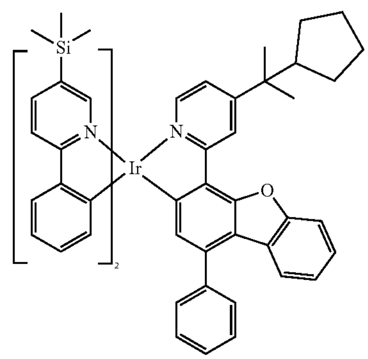
254
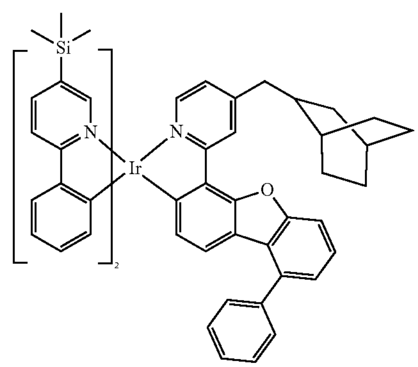
255
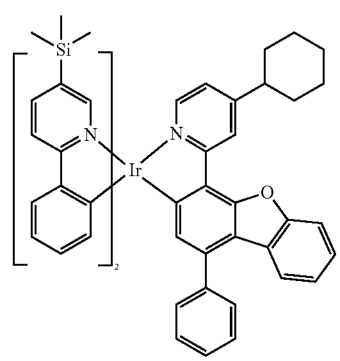
256
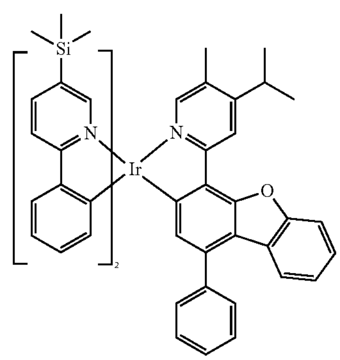

-continued
257
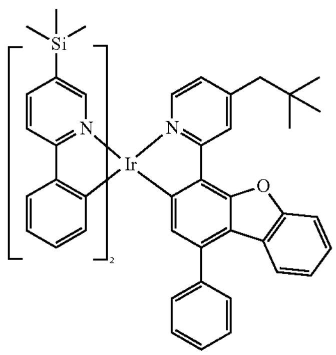
258
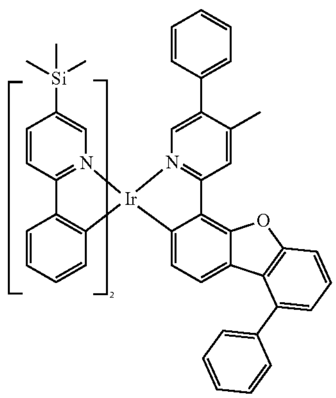
259
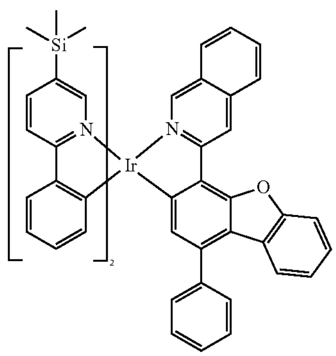
260
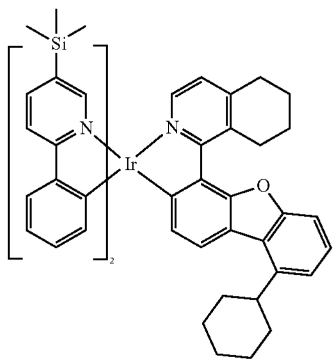
-continued
261
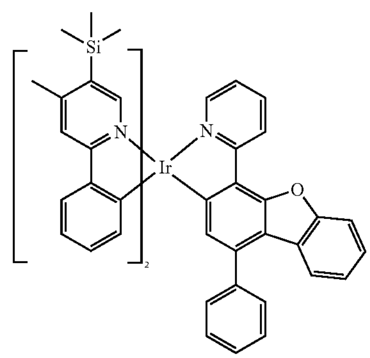
262
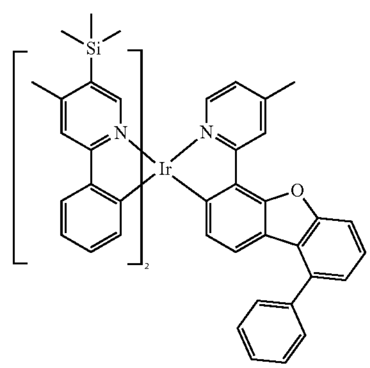
263
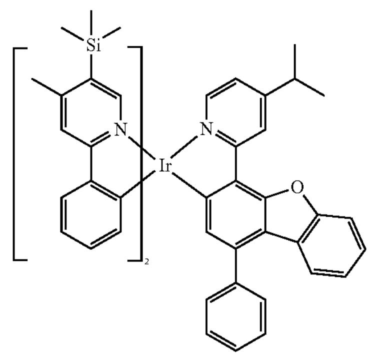
264
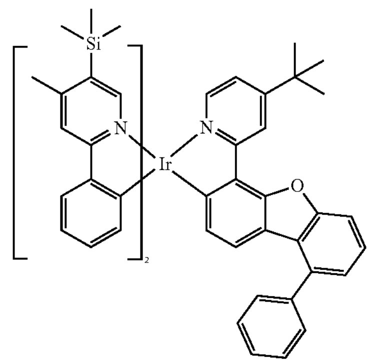

-continued
265
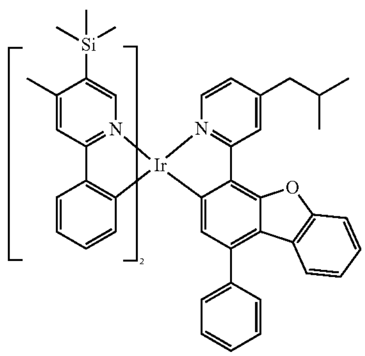
266
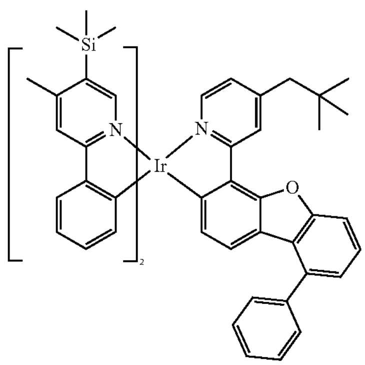
267
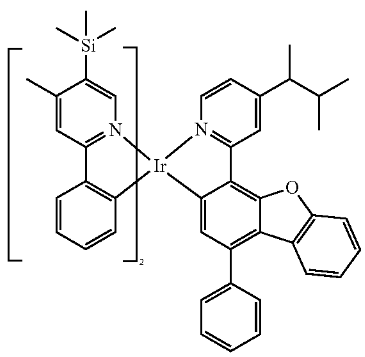
268
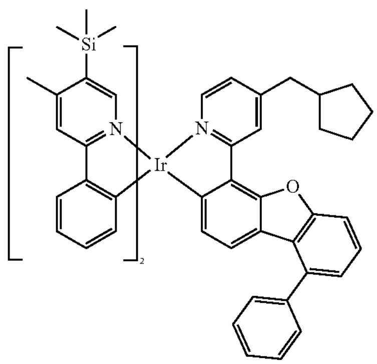
-continued
269
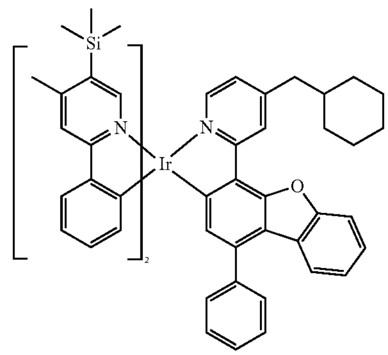
270
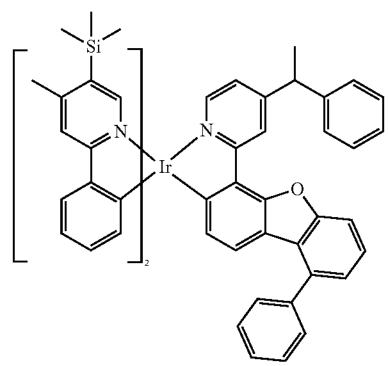
271
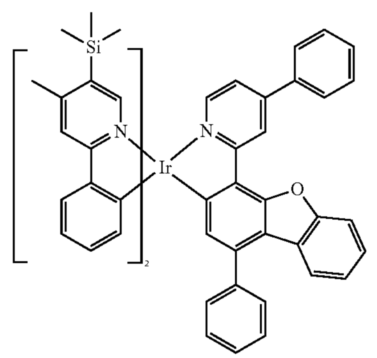
272
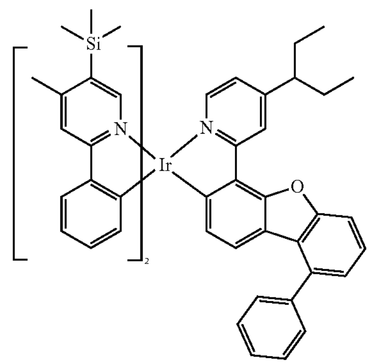

-continued
273
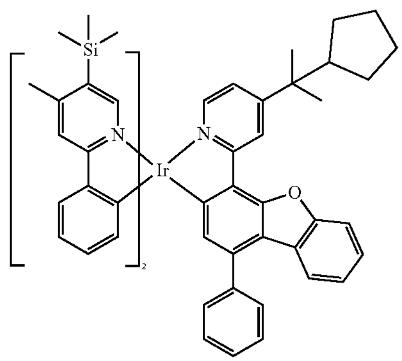
274
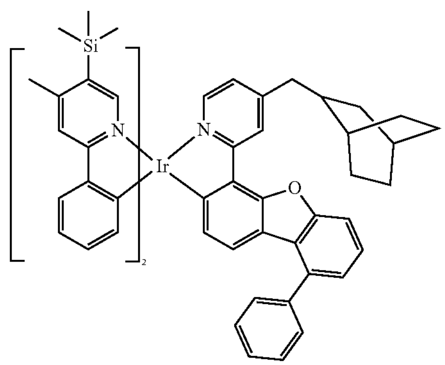
275
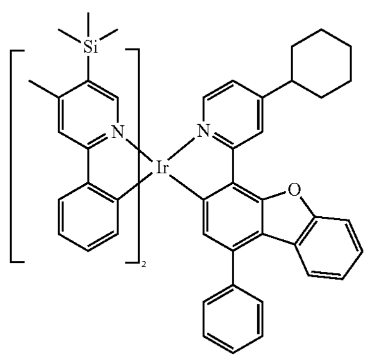
276
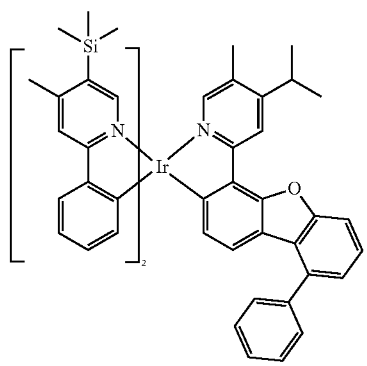
-continued
277
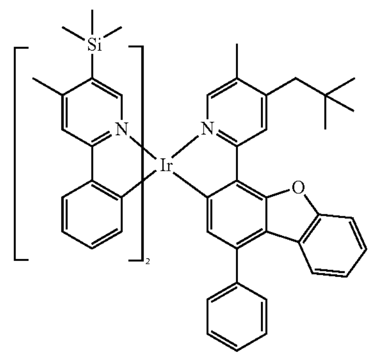
278
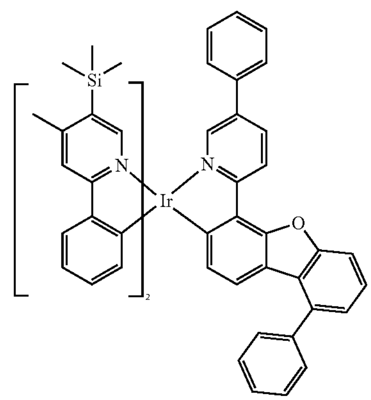
279
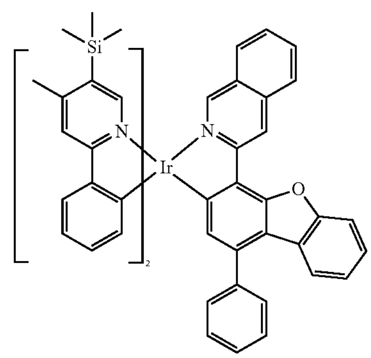
280
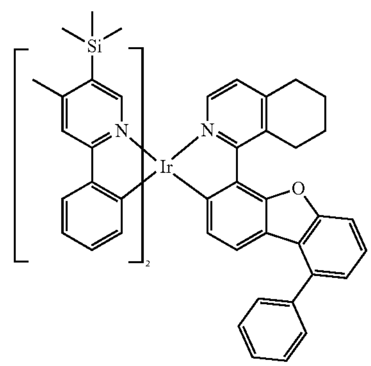

281
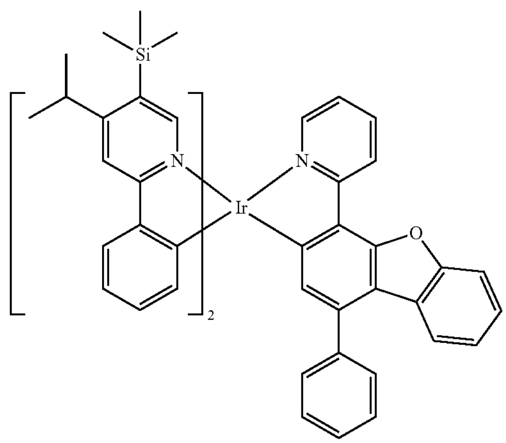
282
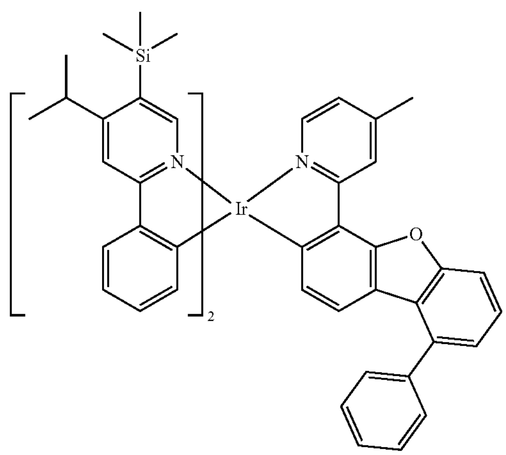
283
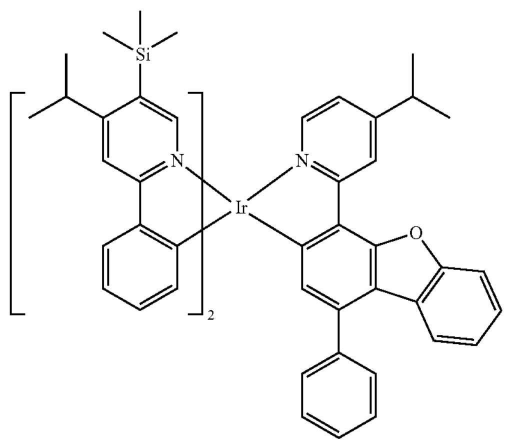

-continued
284
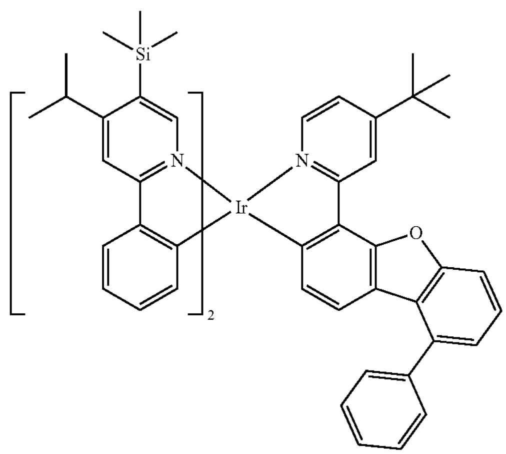
285
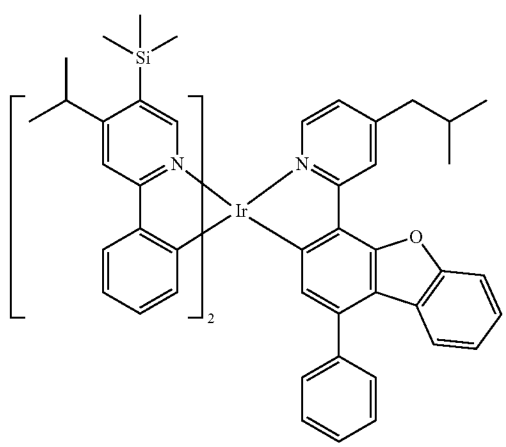
286
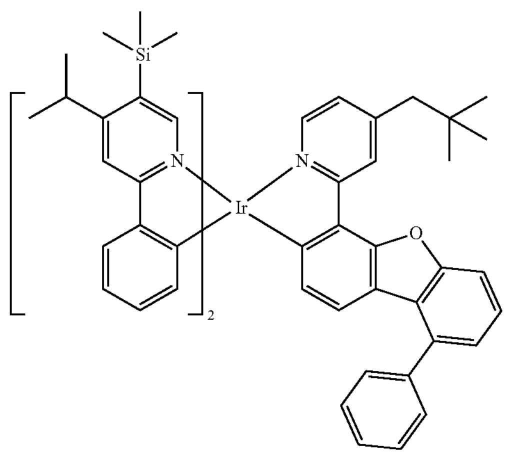

-continued
287
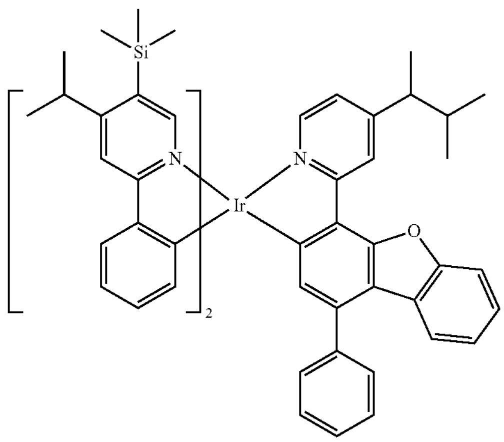
288
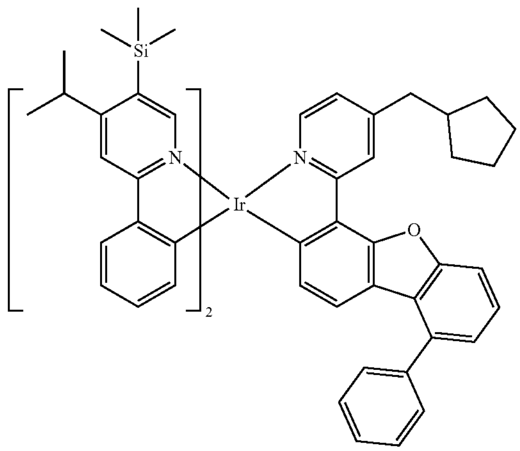
289
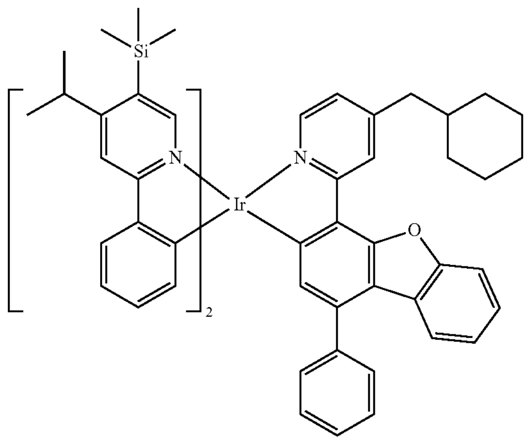

-continued
290
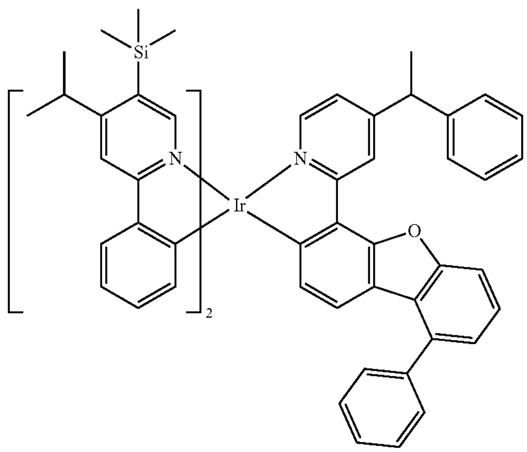
291
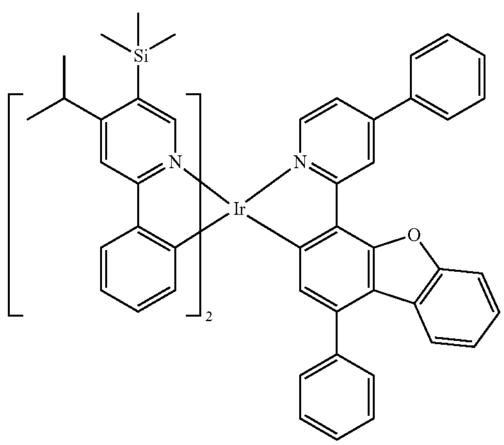
292
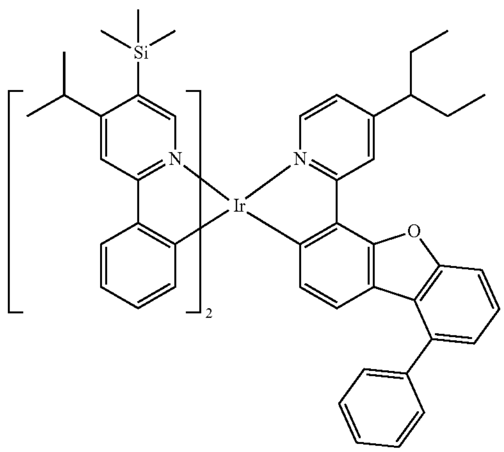

-continued
293
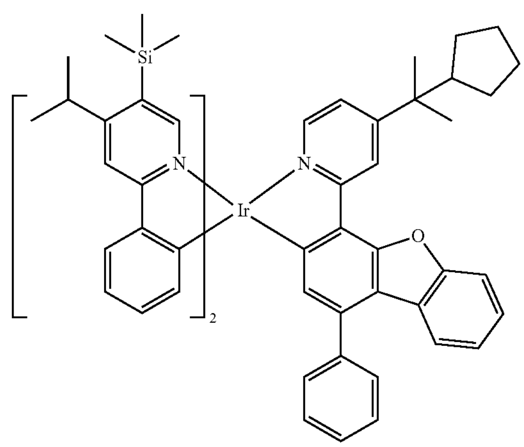
294
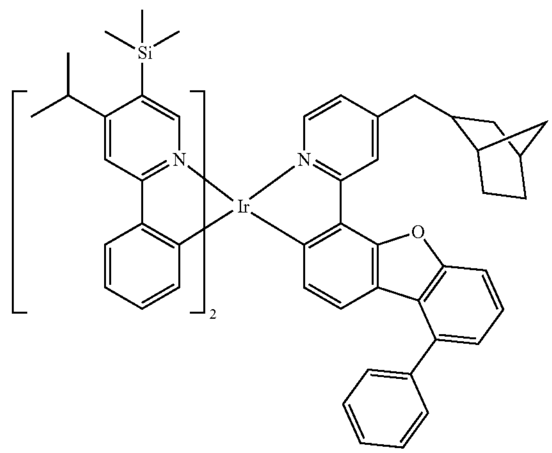
295
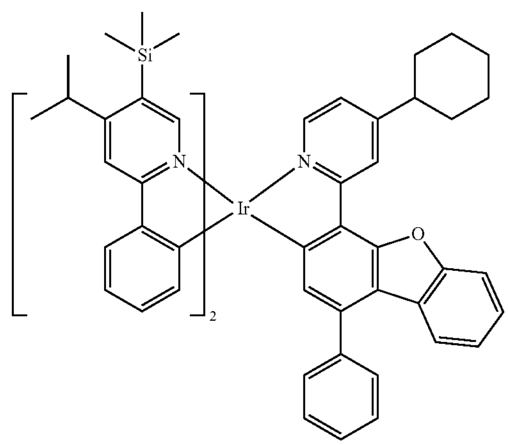

-continued
296
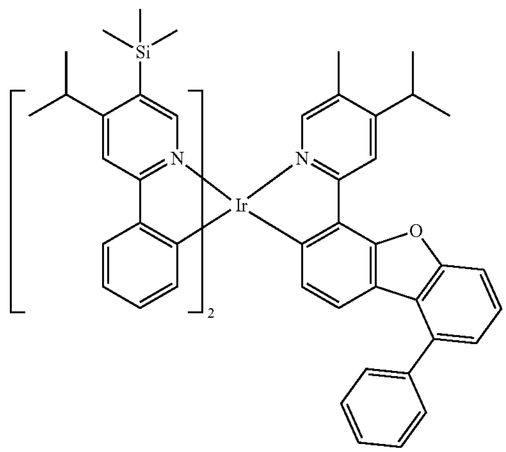
297
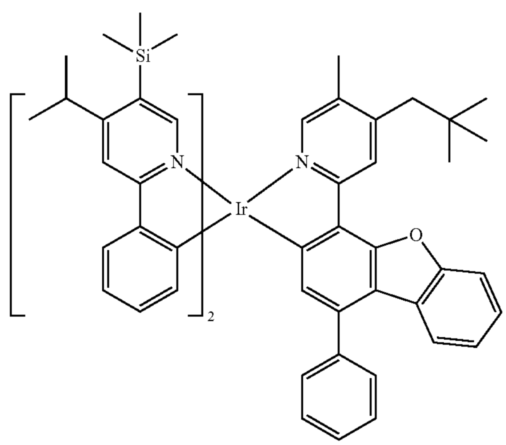
298
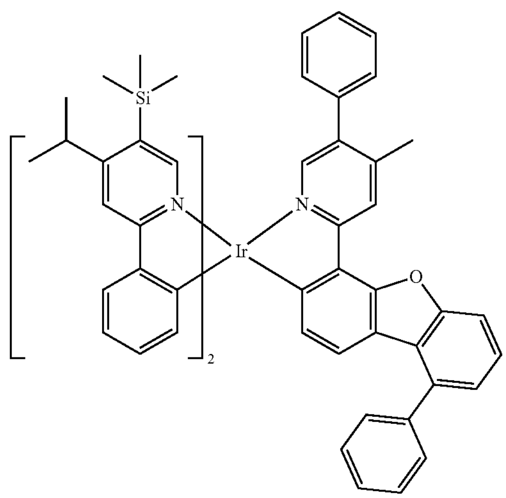

-continued
299
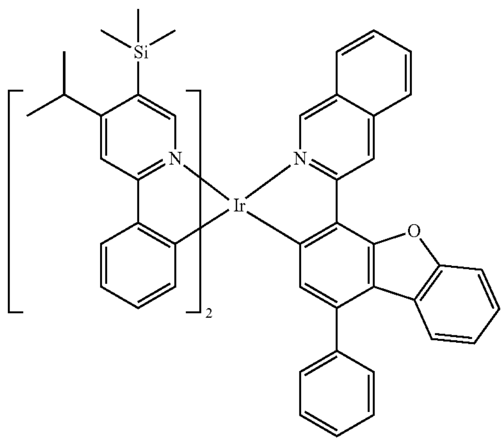
300
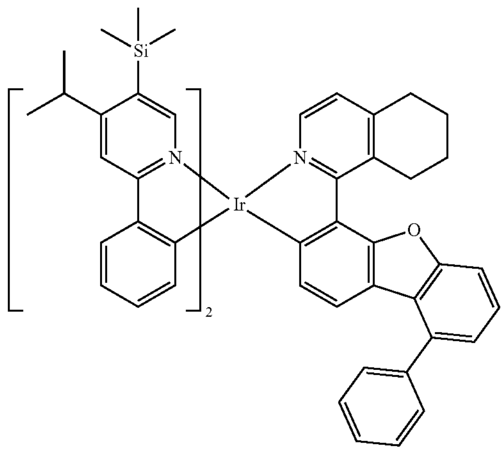
301
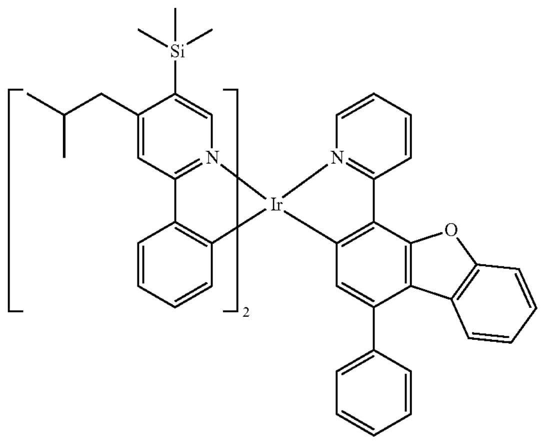

-continued
302
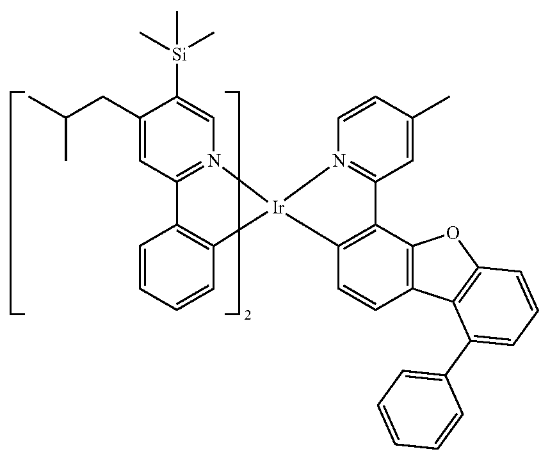
303
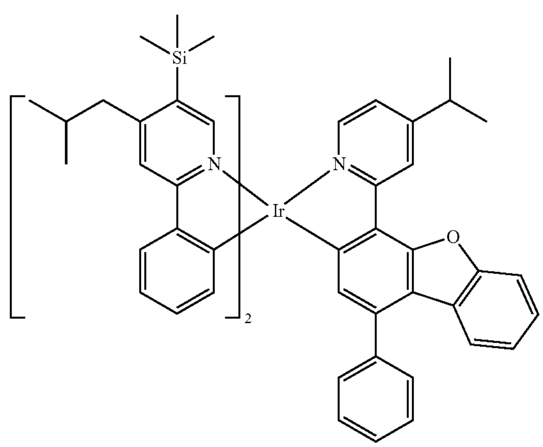
304
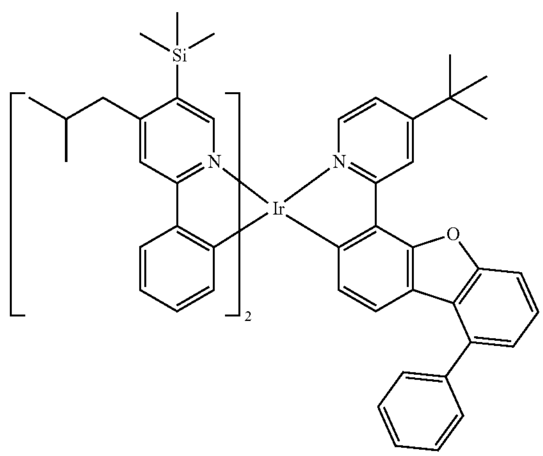

-continued
305
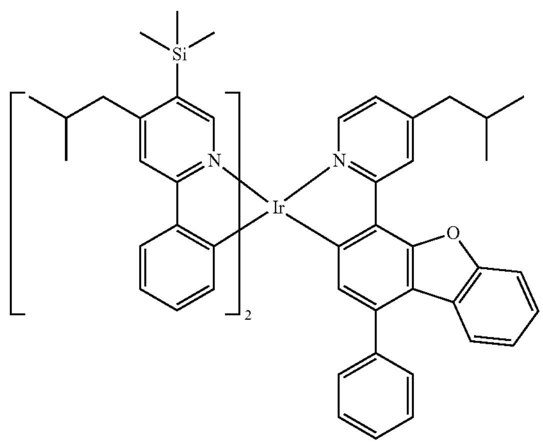
306
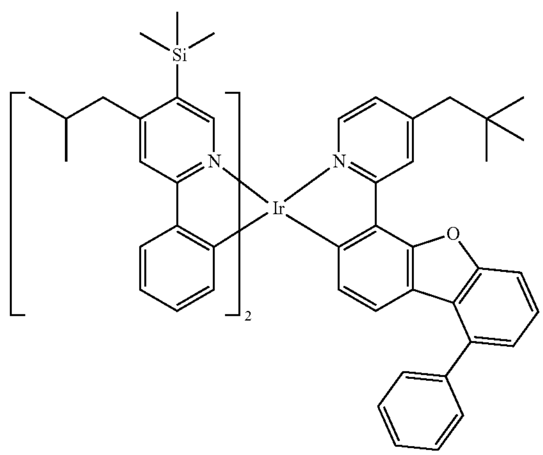
307
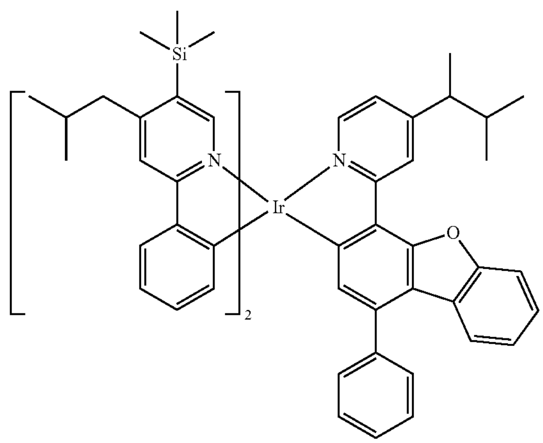

-continued
308
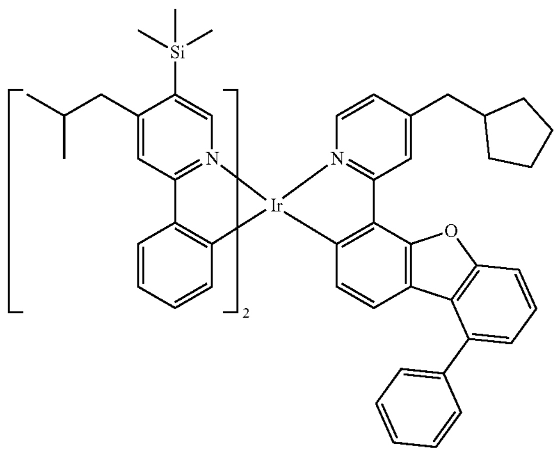
309
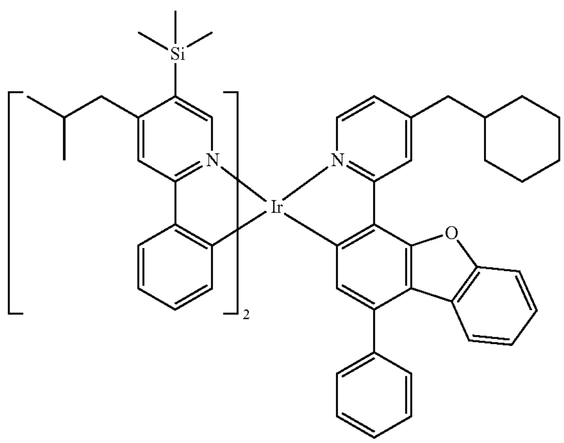
310
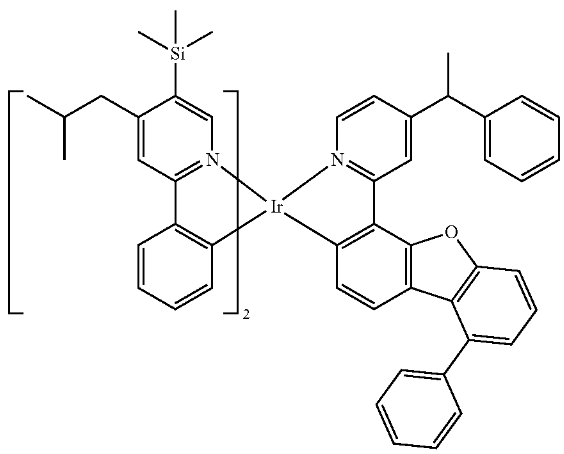

-continued
311
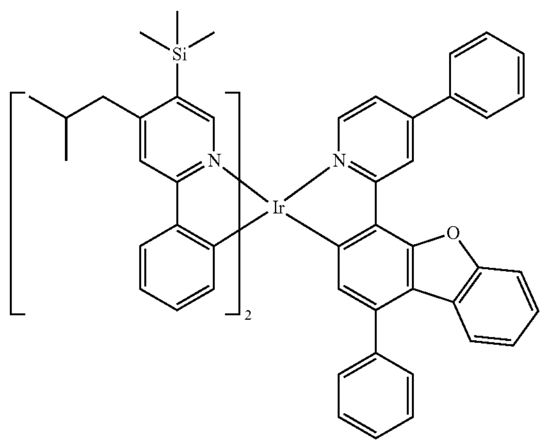
312
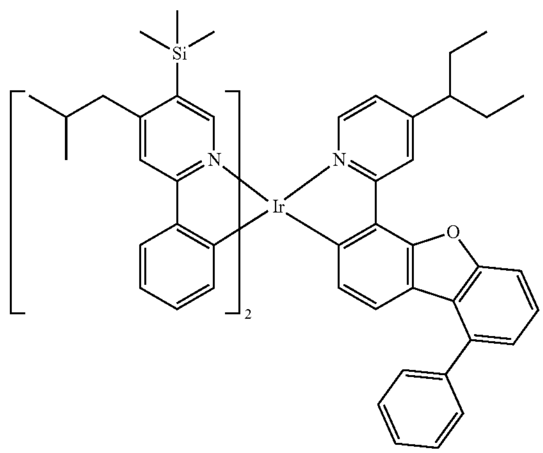
313
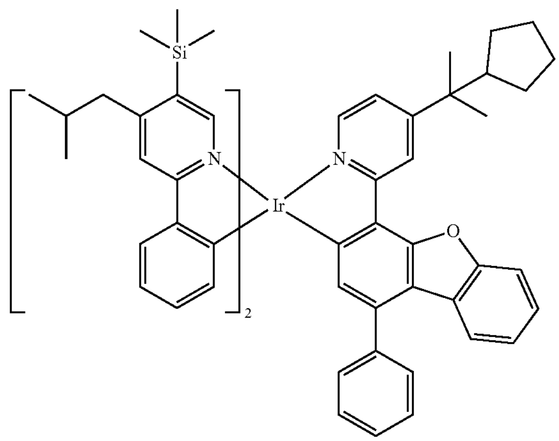

-continued
314
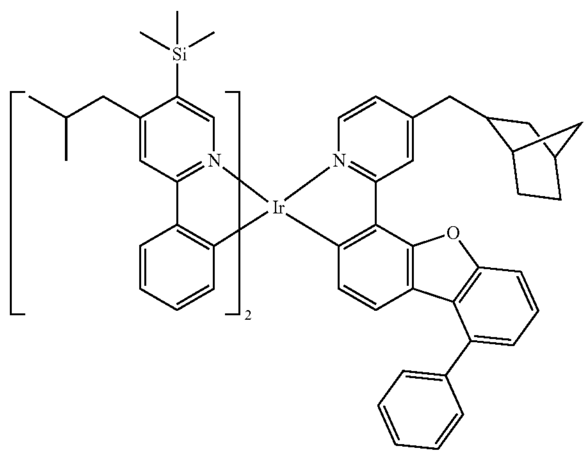
315
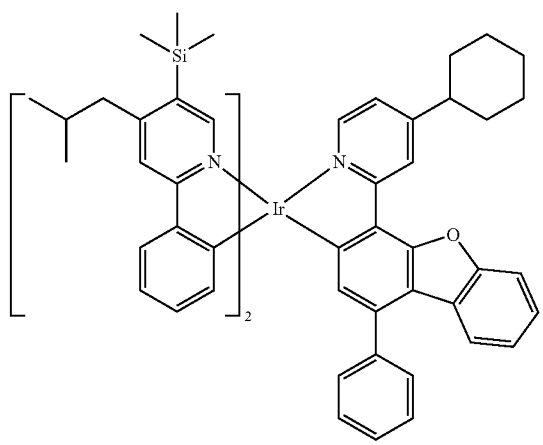
316
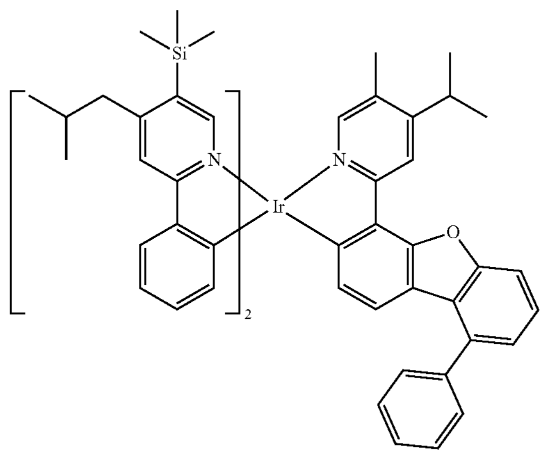

-continued
317
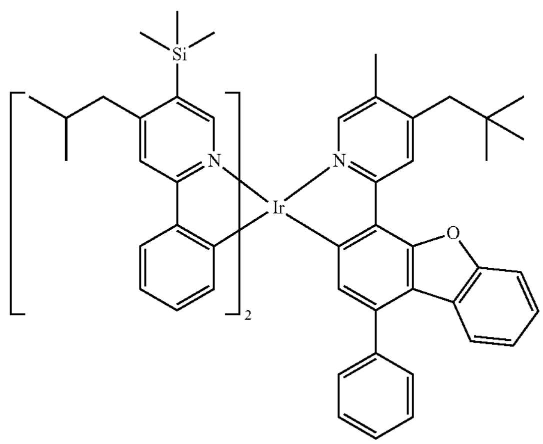
318
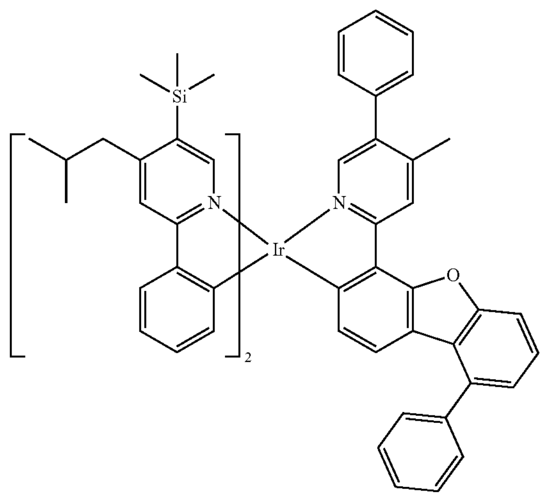
319
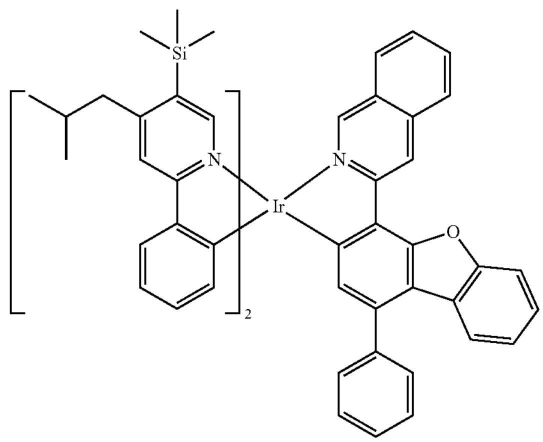

-continued
320
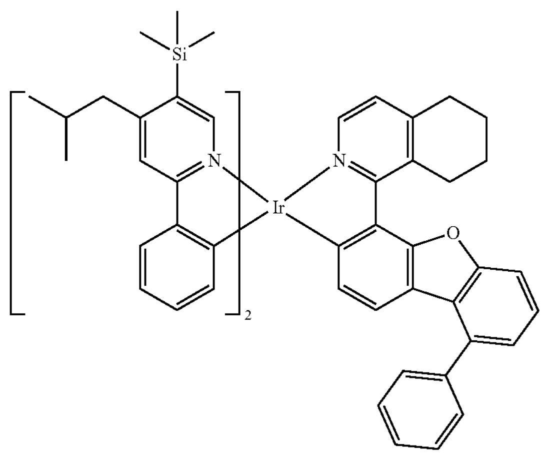
321
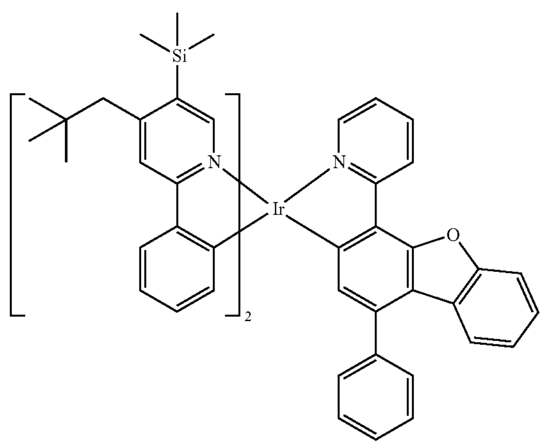
322
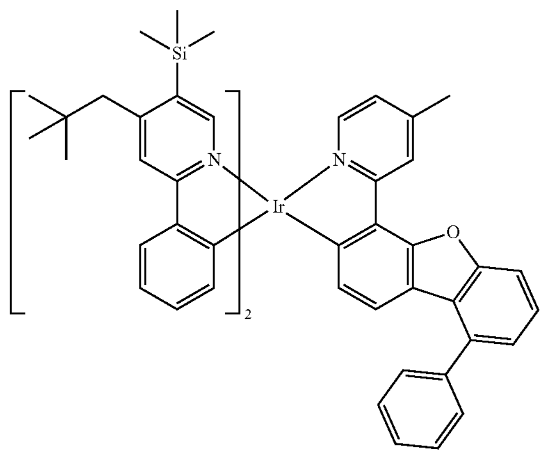

-continued
323
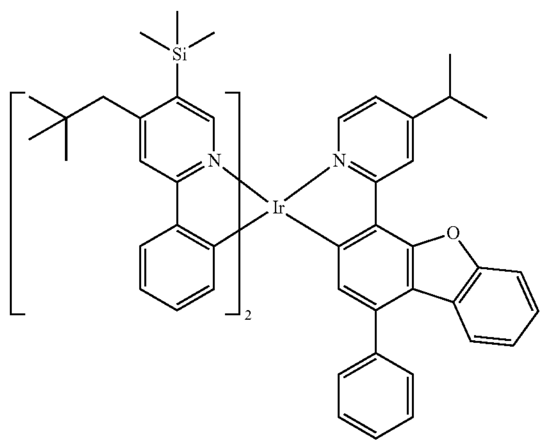
324
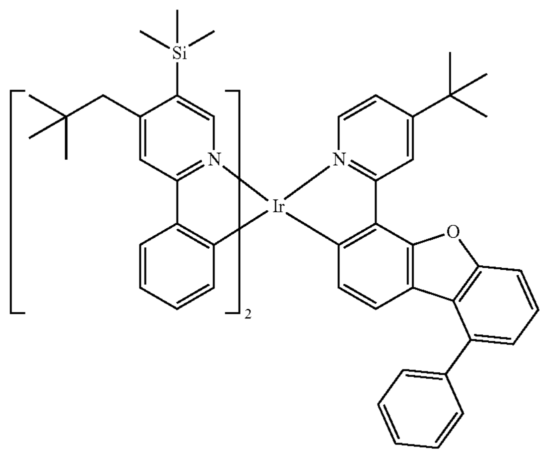
325
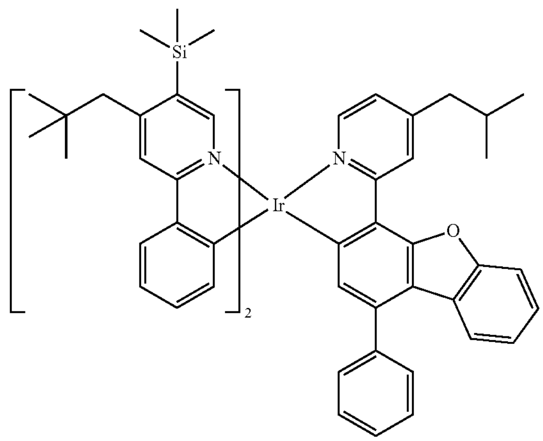

-continued
326
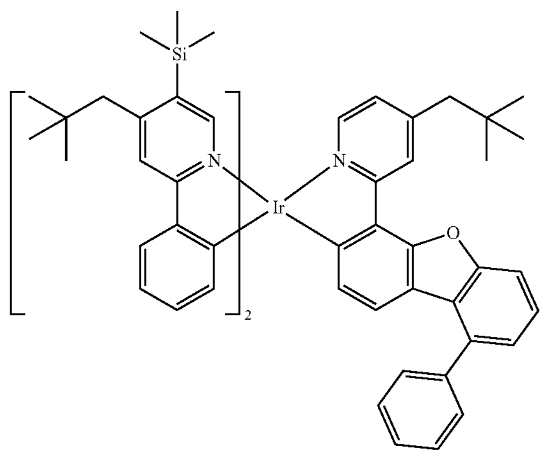
327
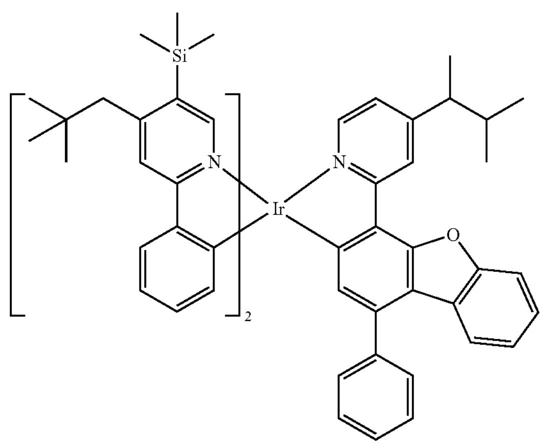
328
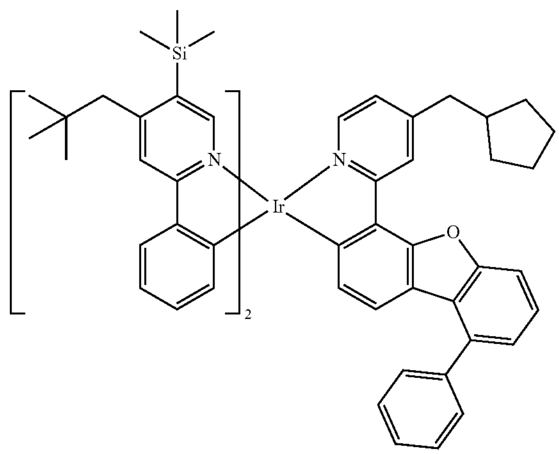

-continued
329
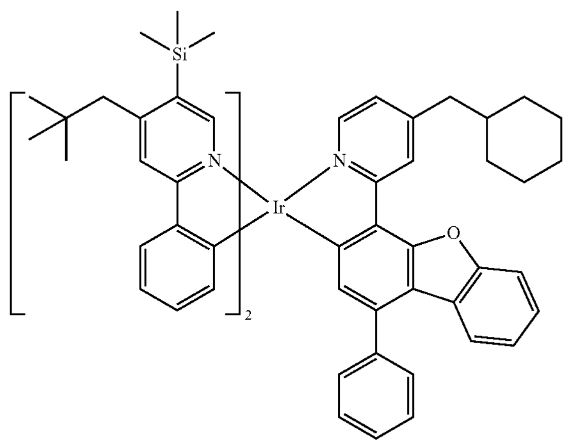
330
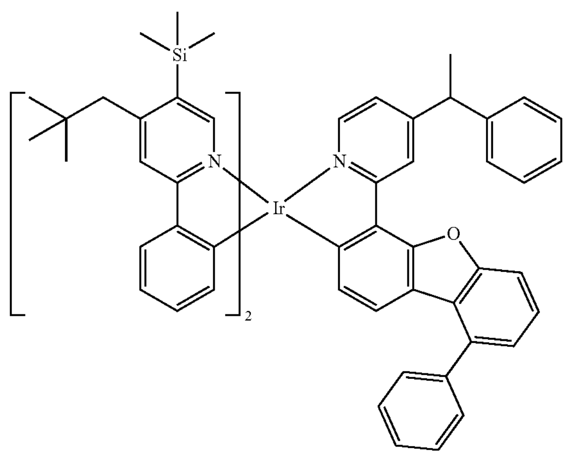
331
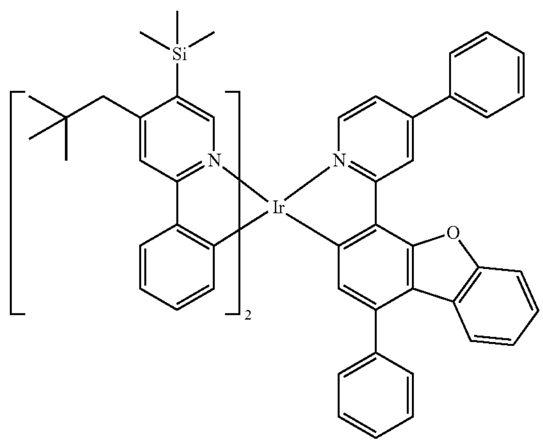

-continued
332
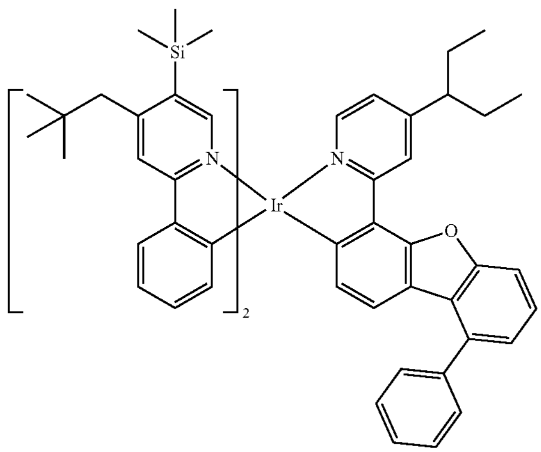
333
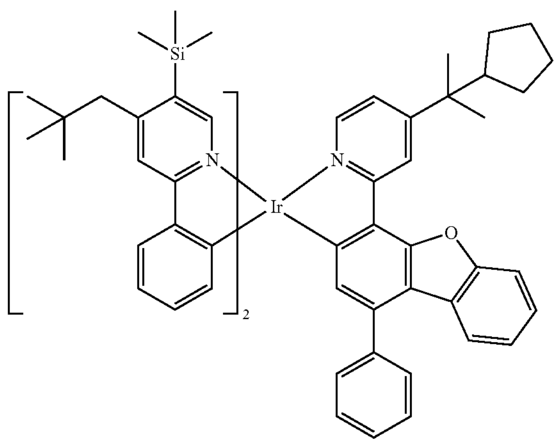
334
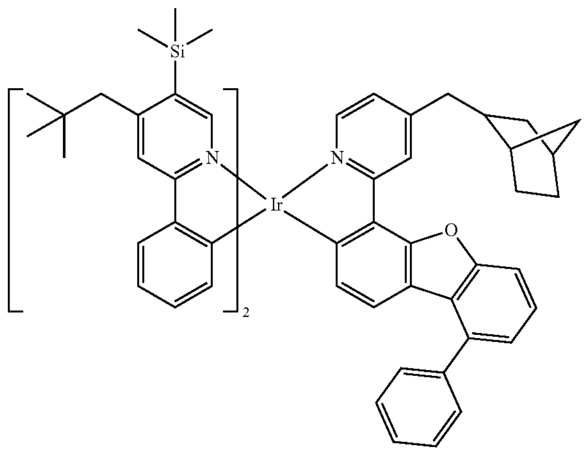

-continued
335
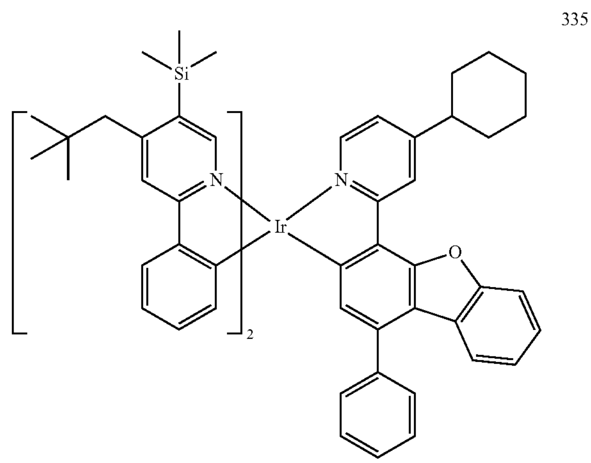
336
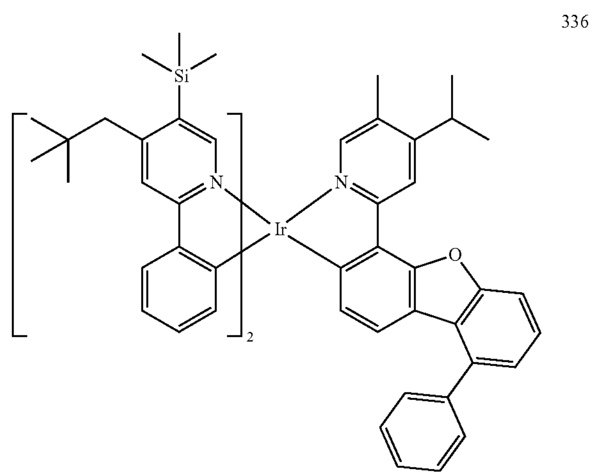
337
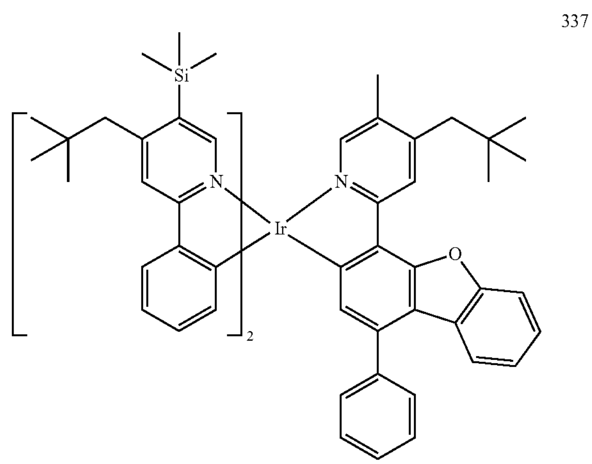

-continued
338
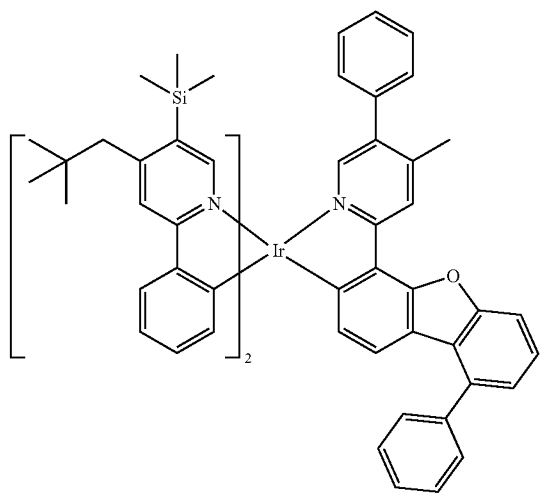
339
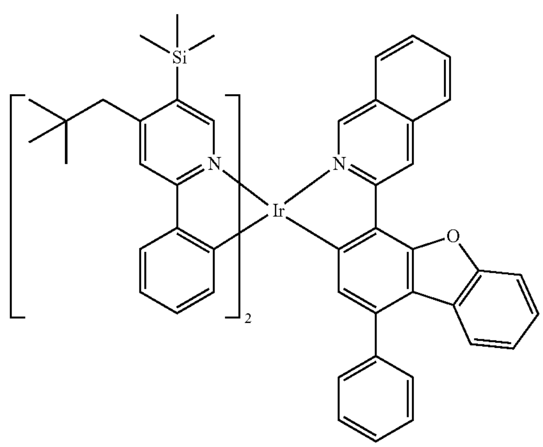
340
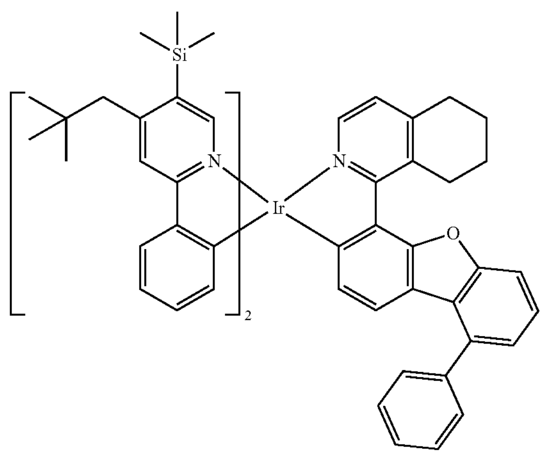

-continued
341
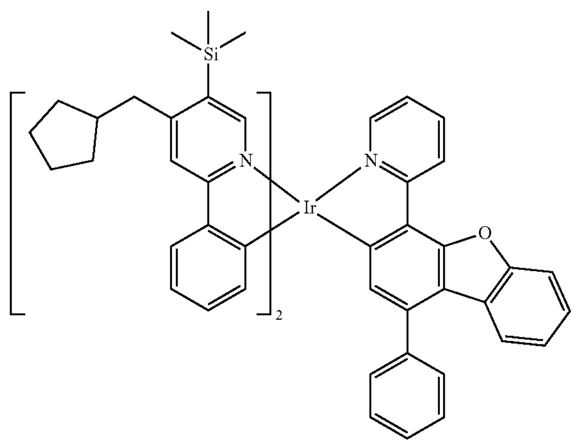
342
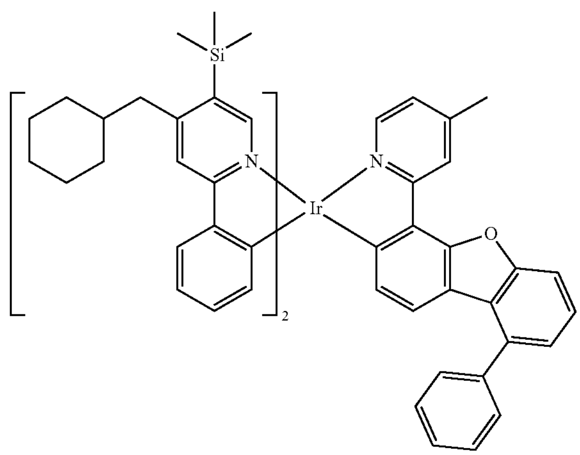
343
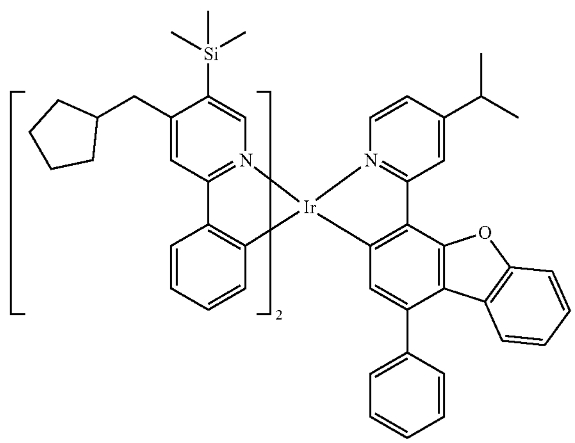

-continued
344
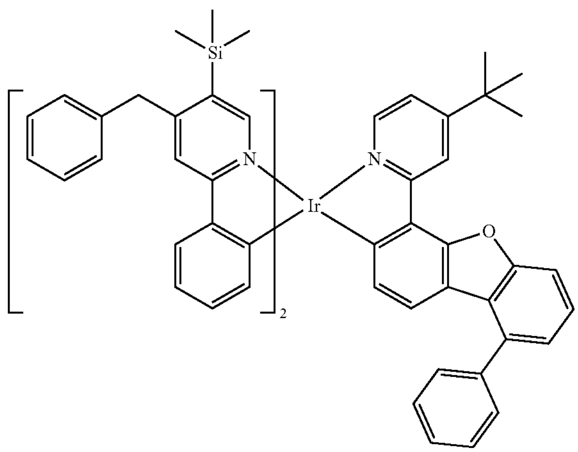
345
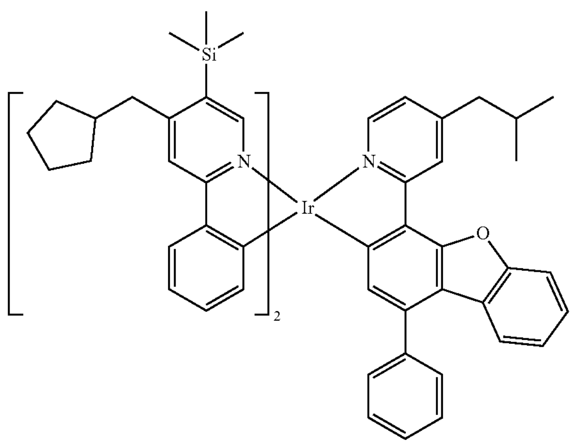
346
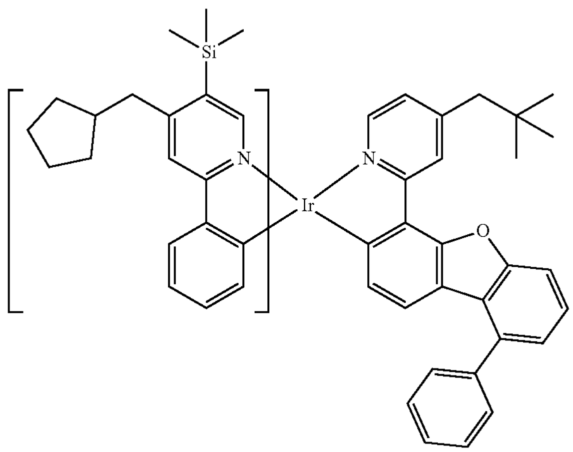

-continued
347
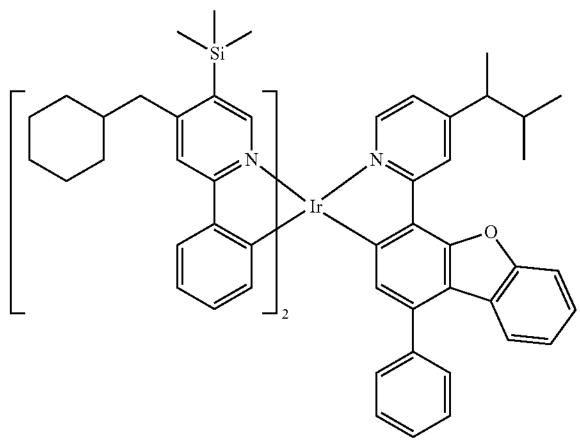
348
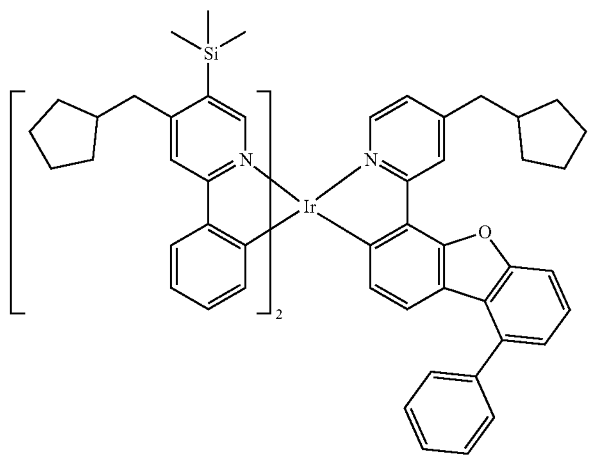
349
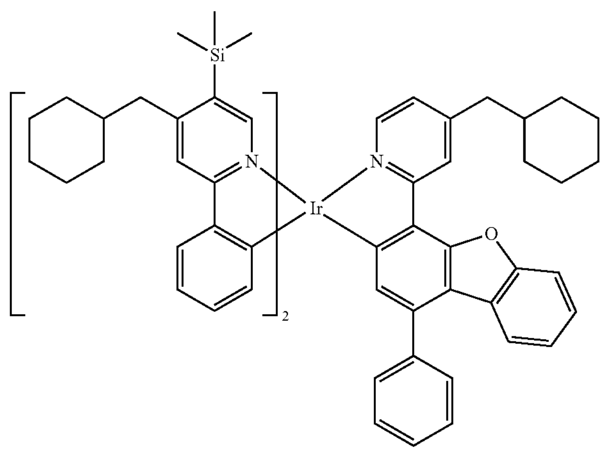

-continued
350
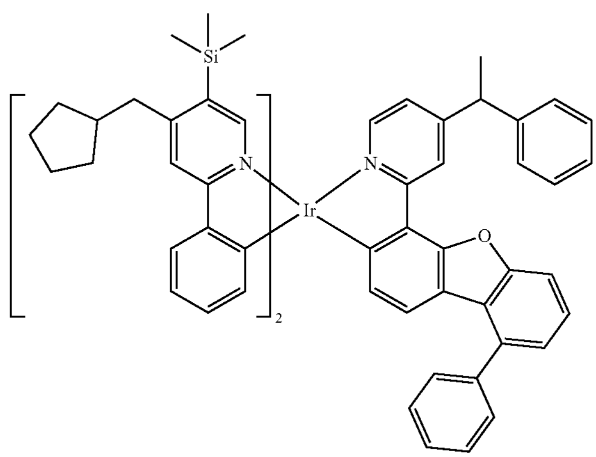
351
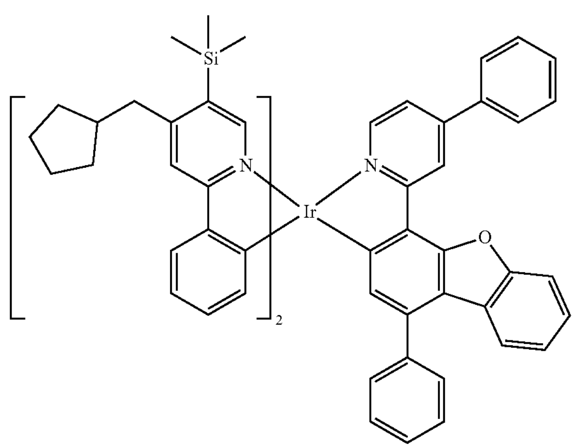
352
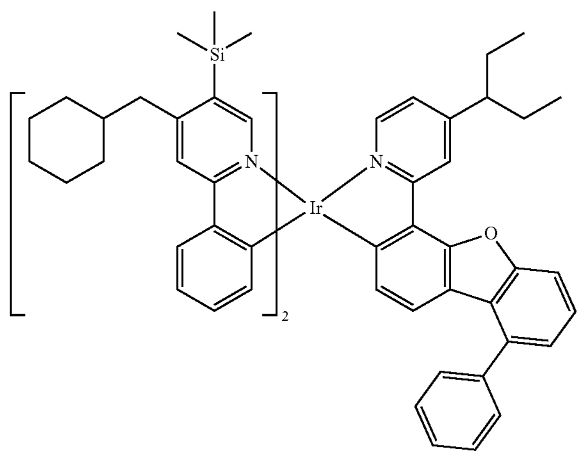

-continued
353
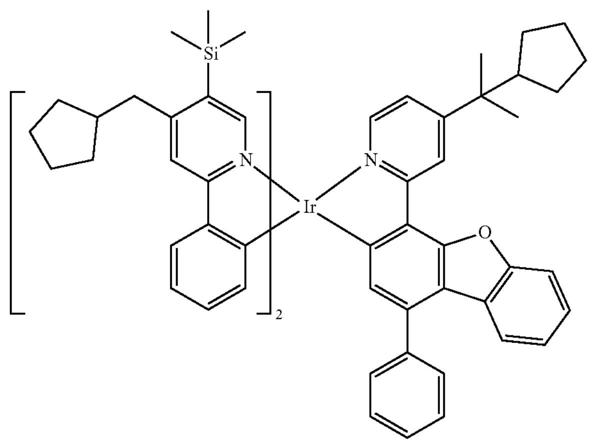
354
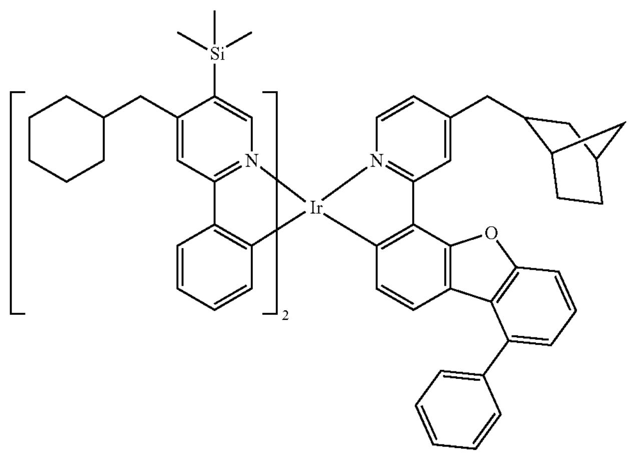
355
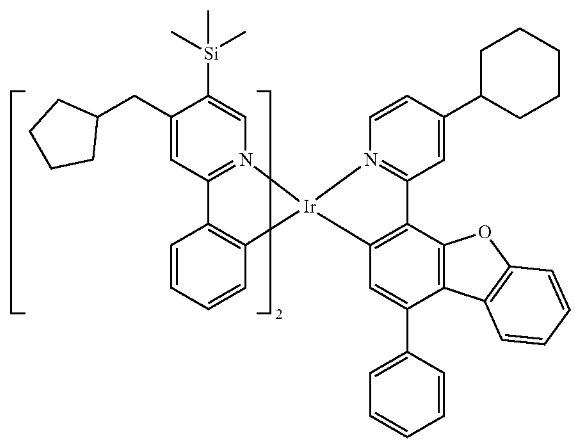

-continued
356
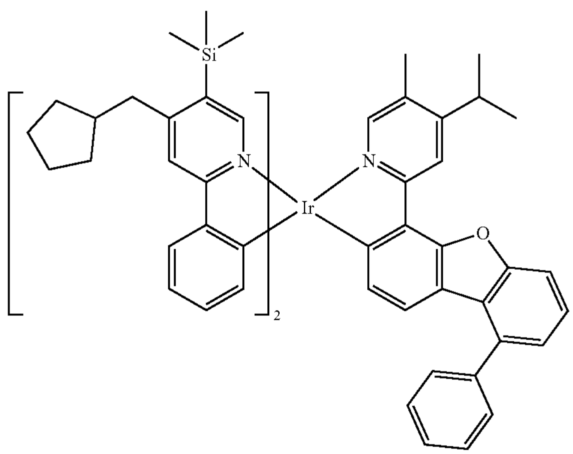
357
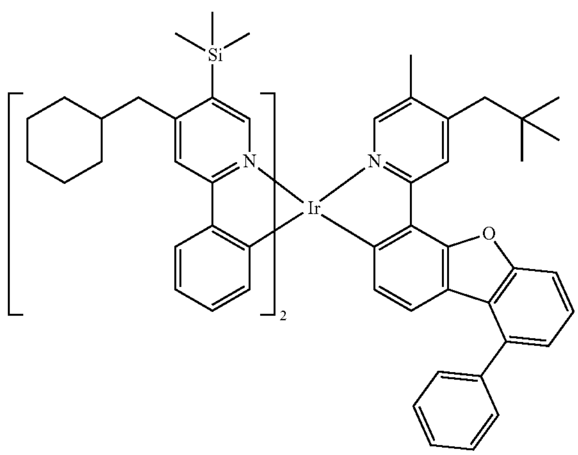
358
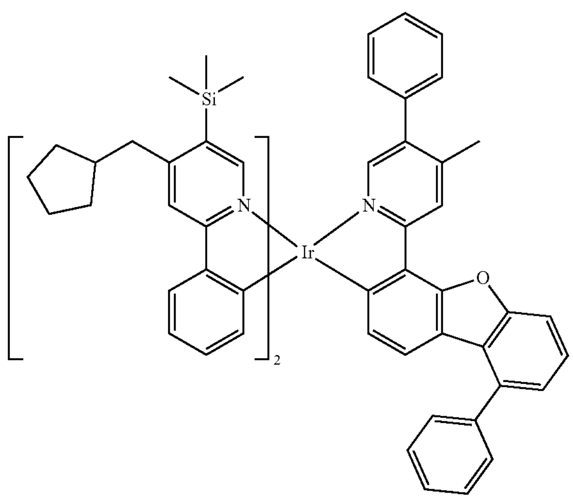

-continued
359
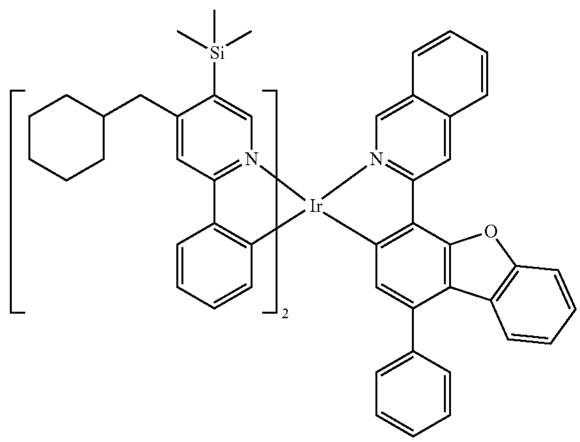
360
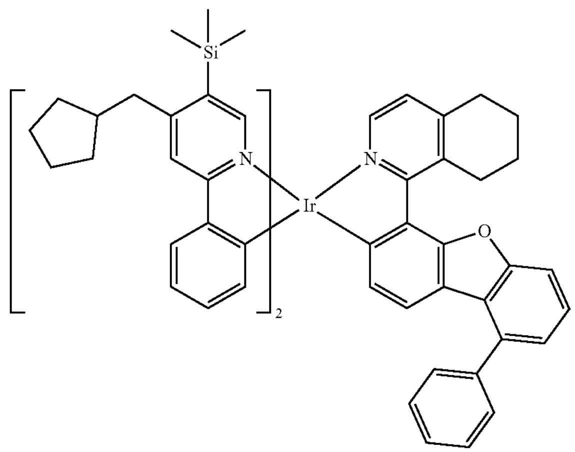
361
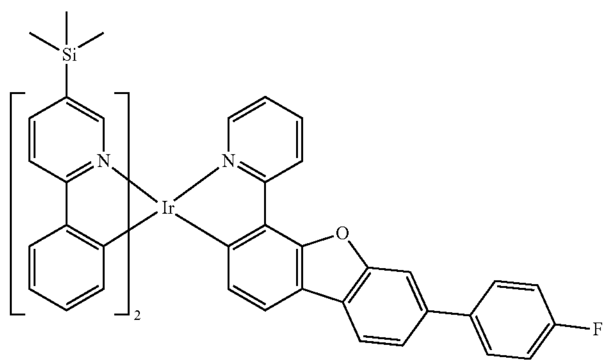
362
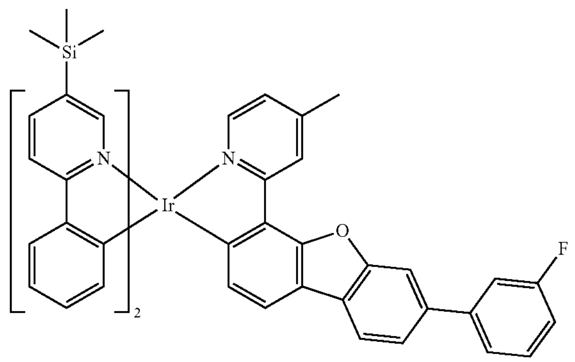

-continued
363
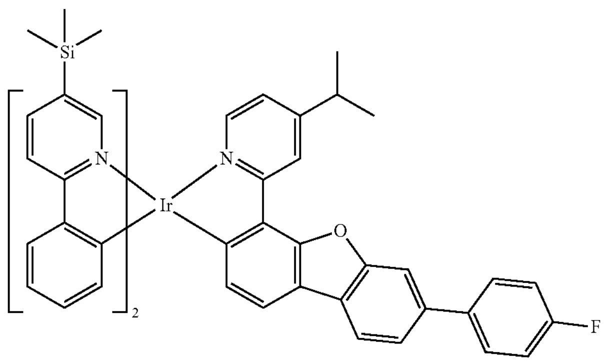
364
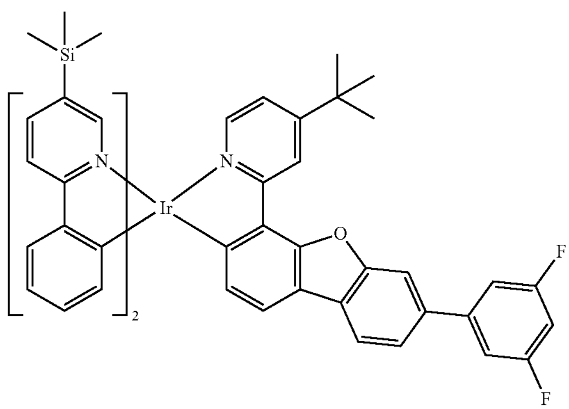
365
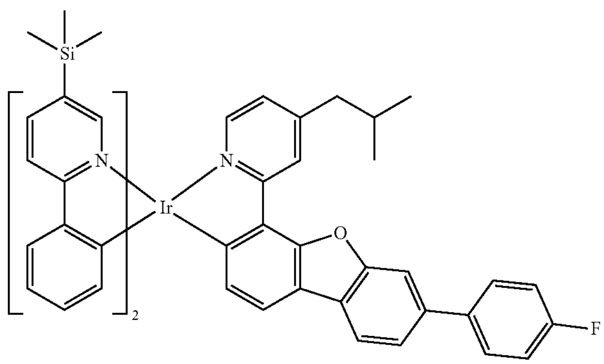
366
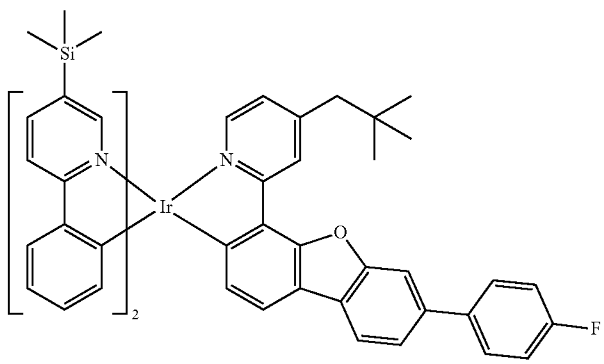

-continued
367
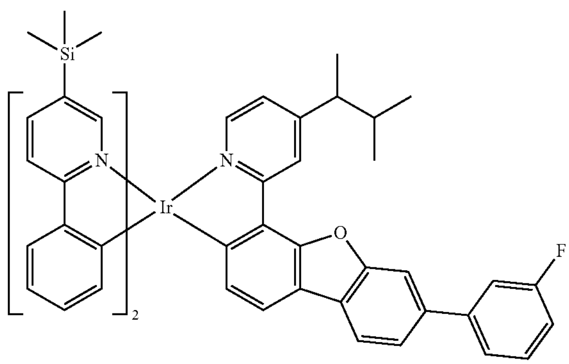
368
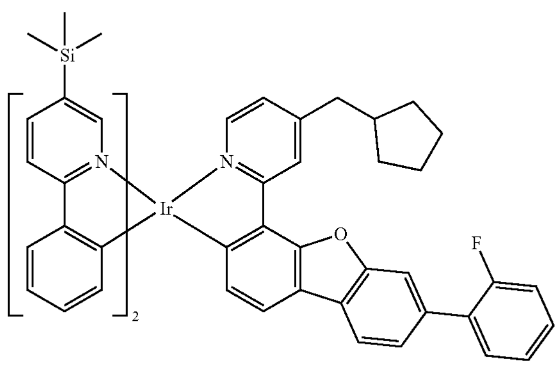
369
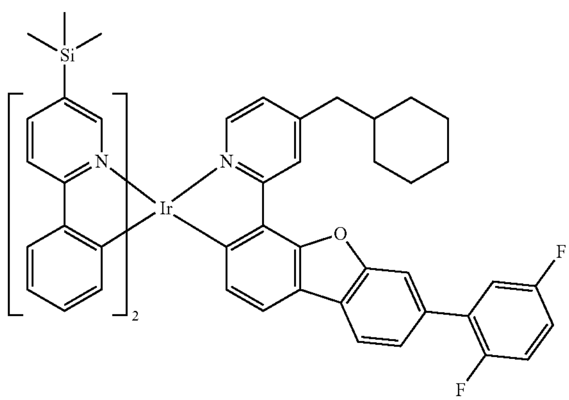
370
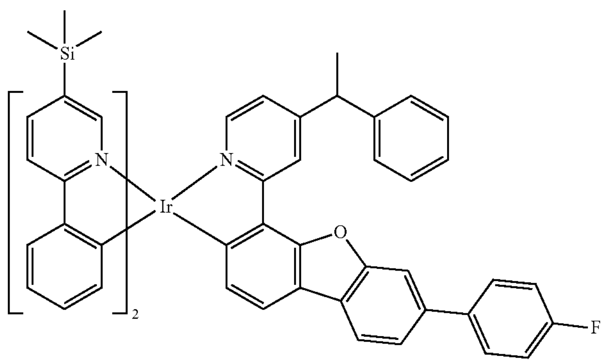

-continued
371
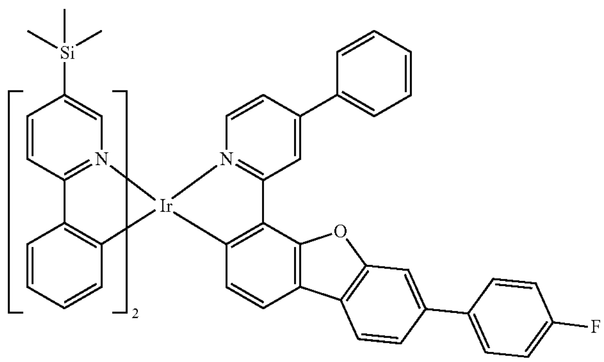
372
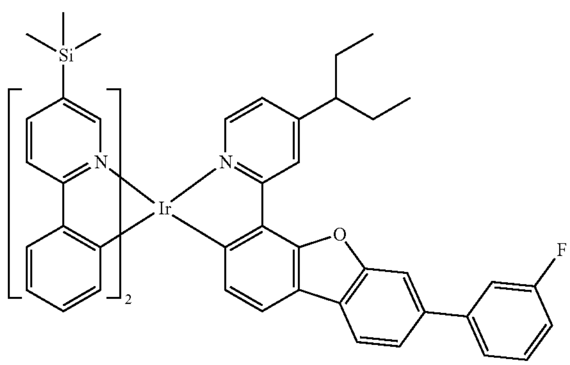
373
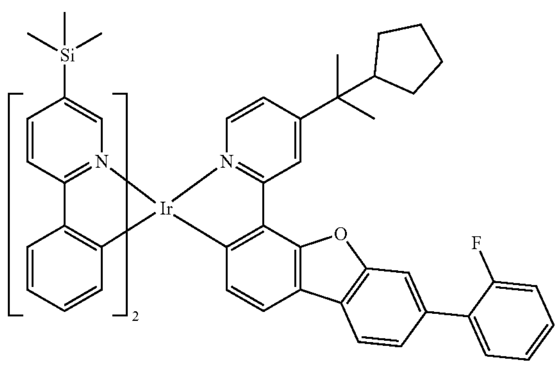
374
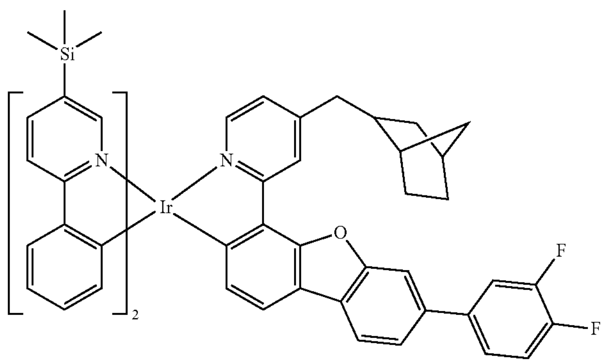

-continued
375
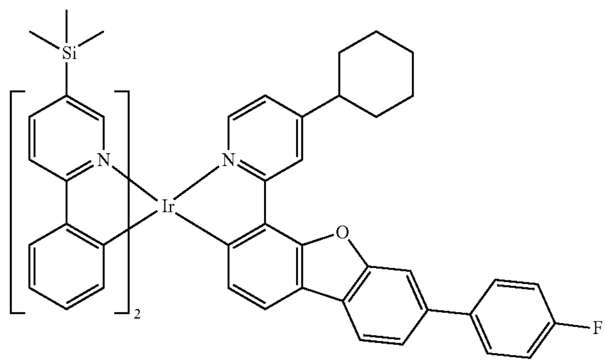
376
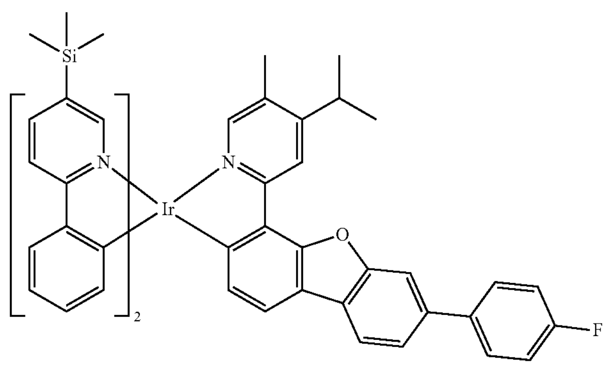
377
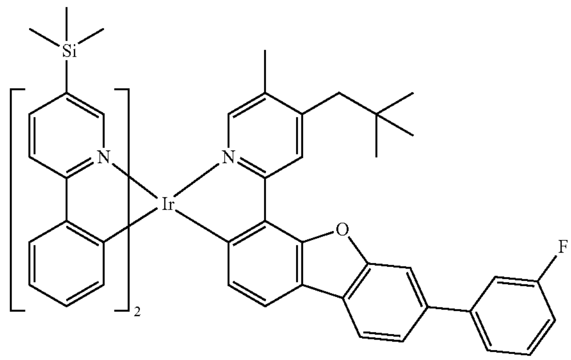
378
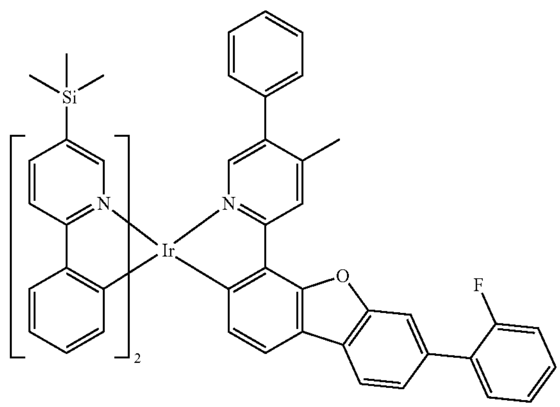

-continued
379
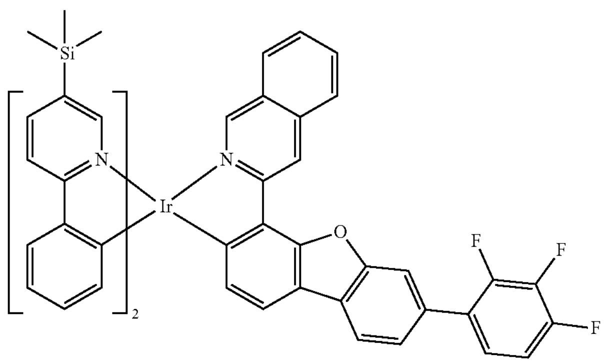
380
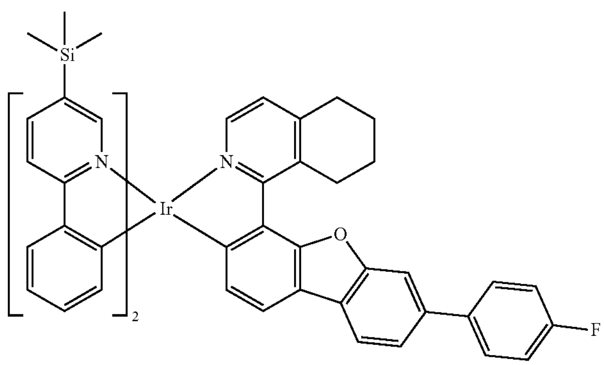
381
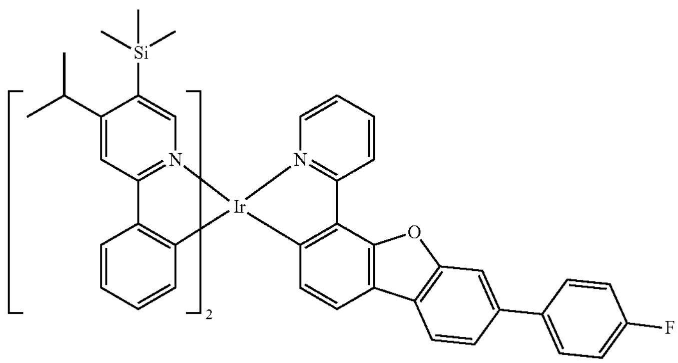
382
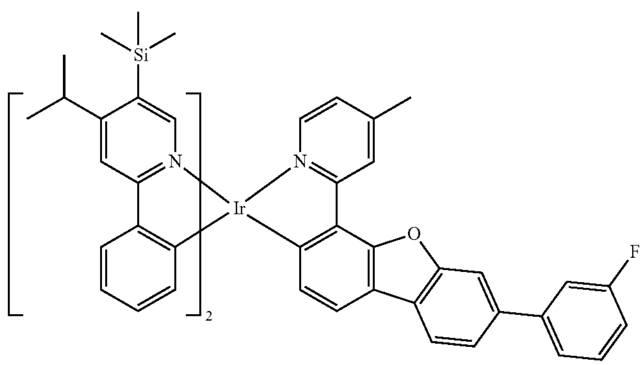

-continued
383
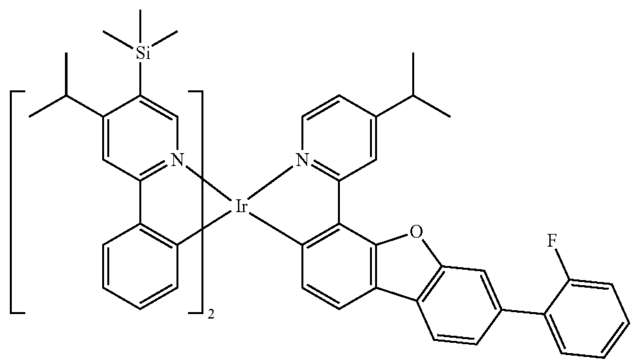
384
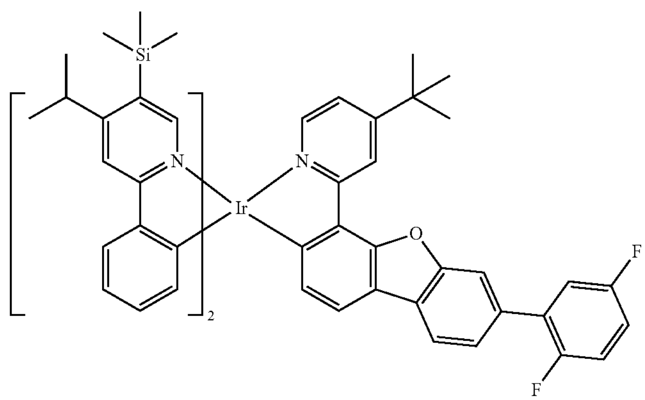
385
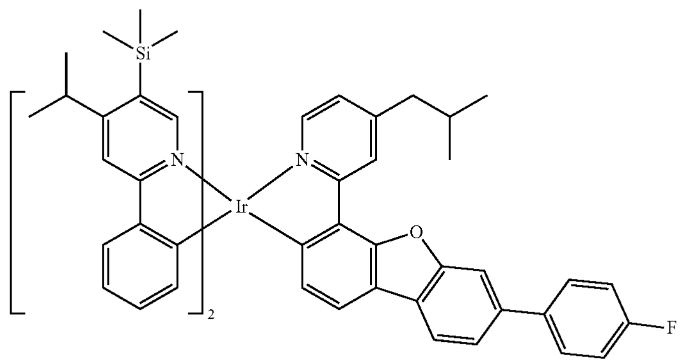
386
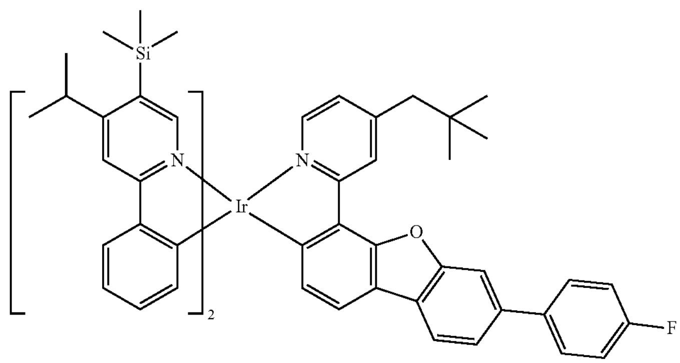

-continued
387
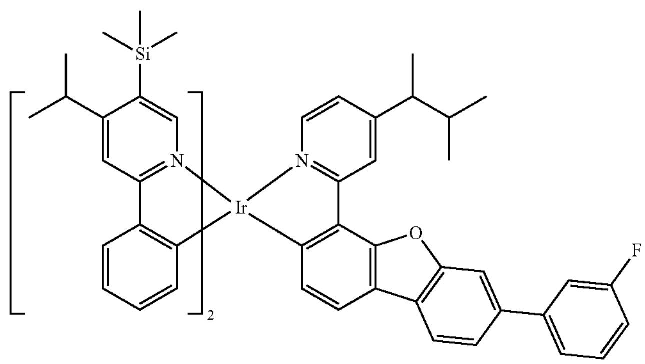
388
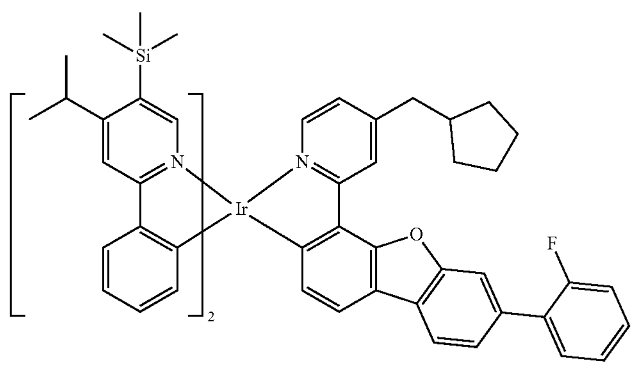
389
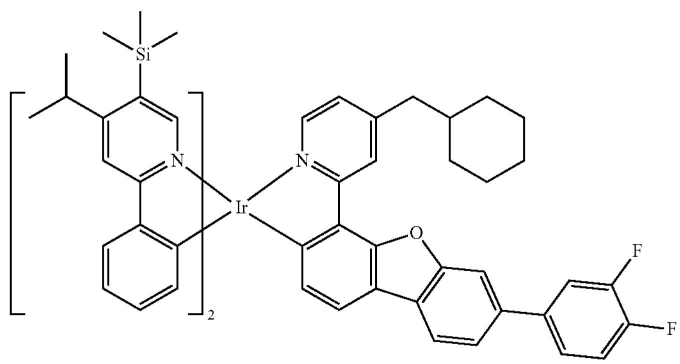
390
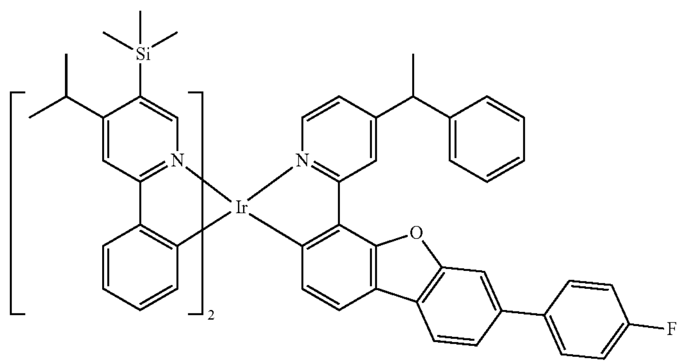

-continued
391
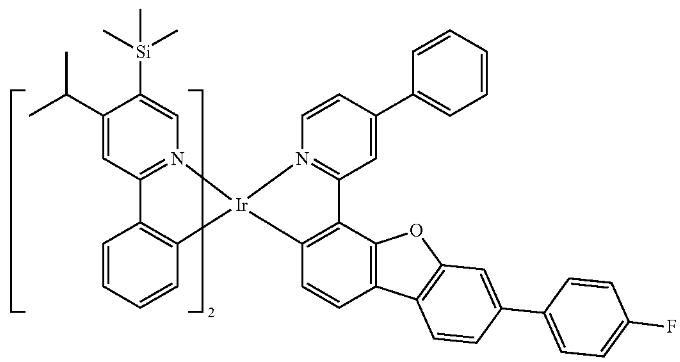
392
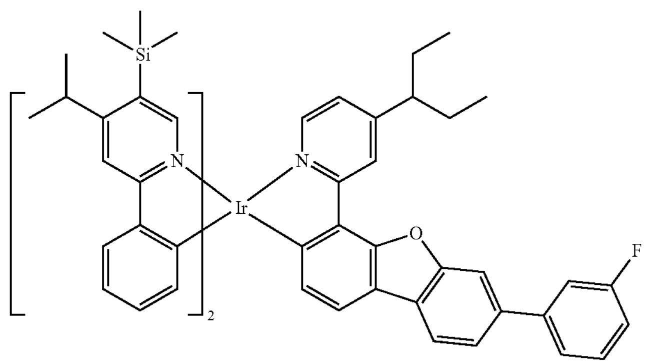
393
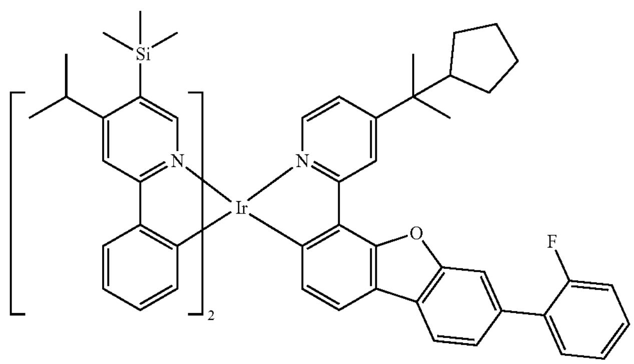
394
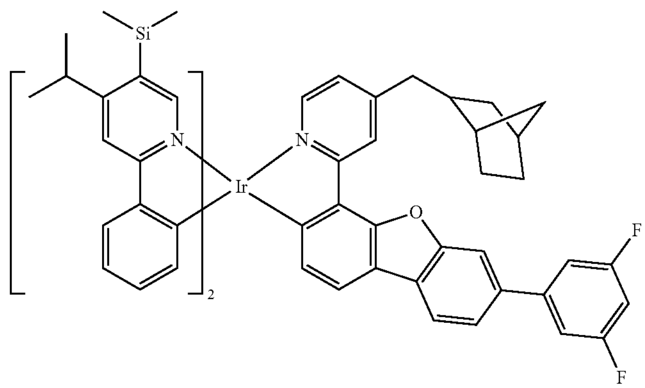

-continued
395
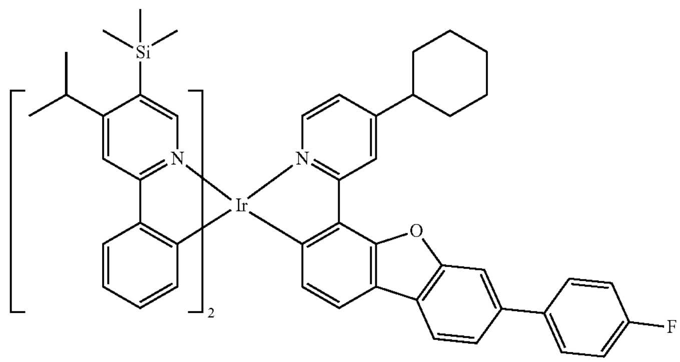
396
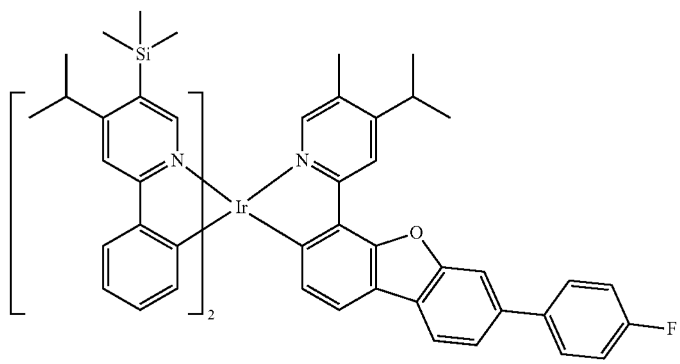
397
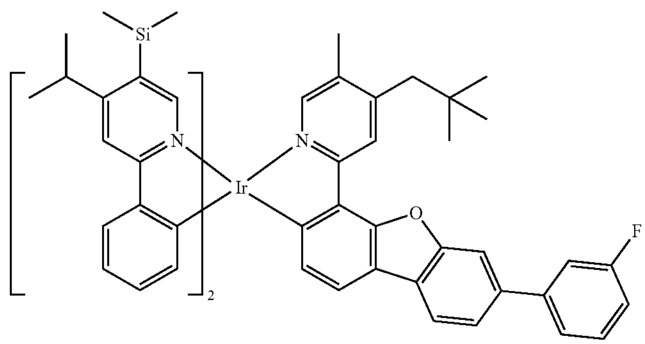
398
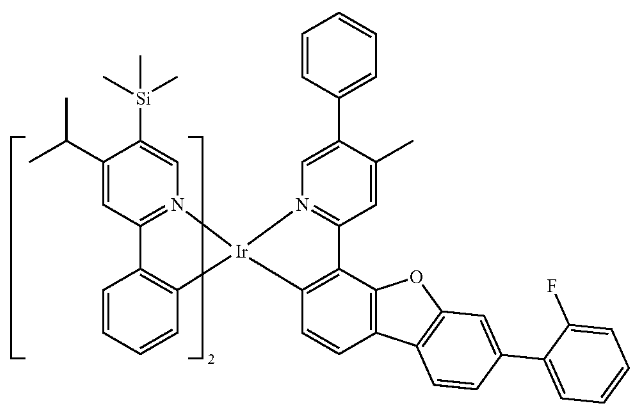

-continued
399
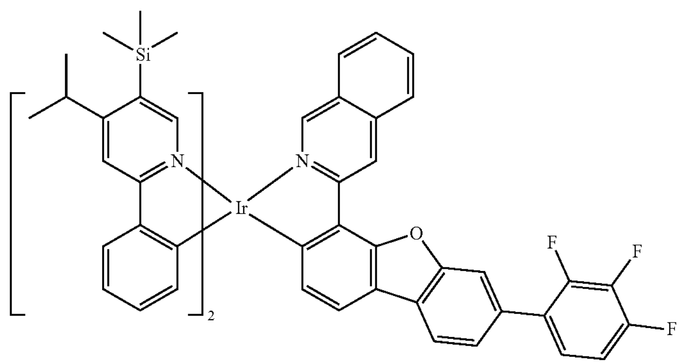
400
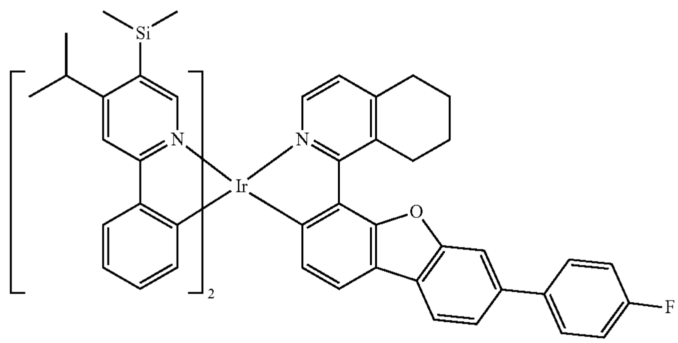
401
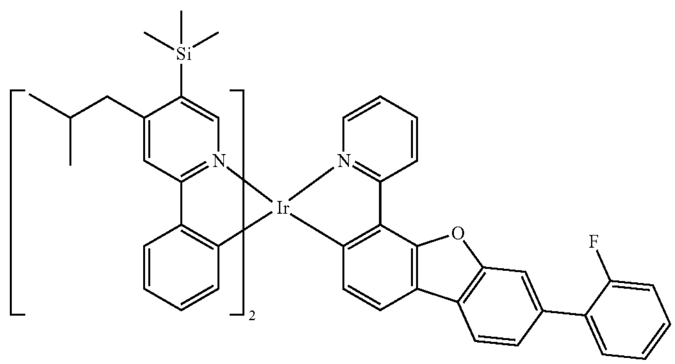
402
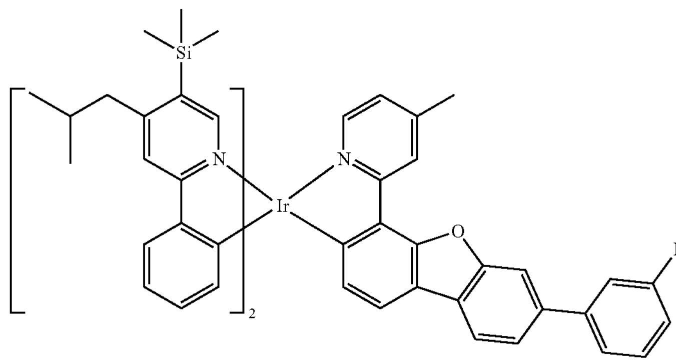

-continued
403
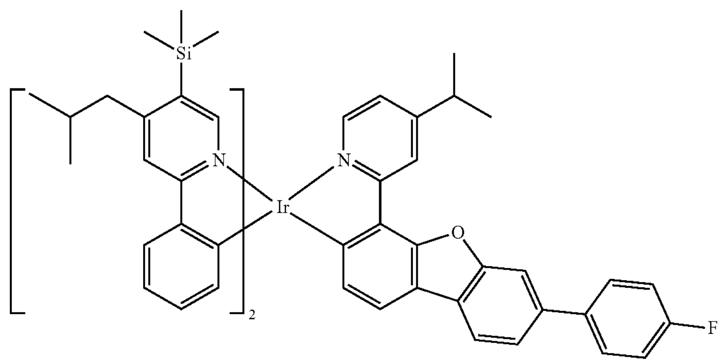
404
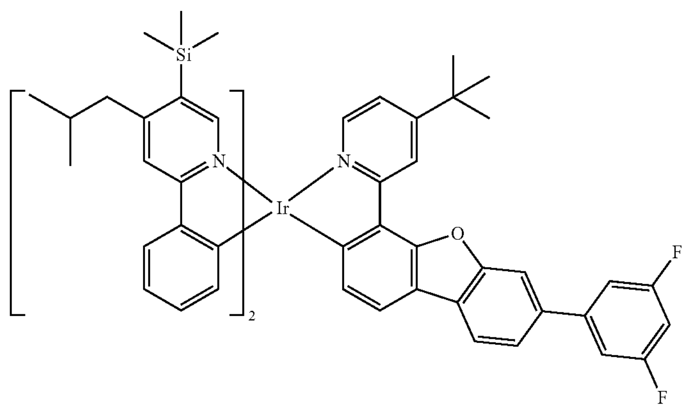
405
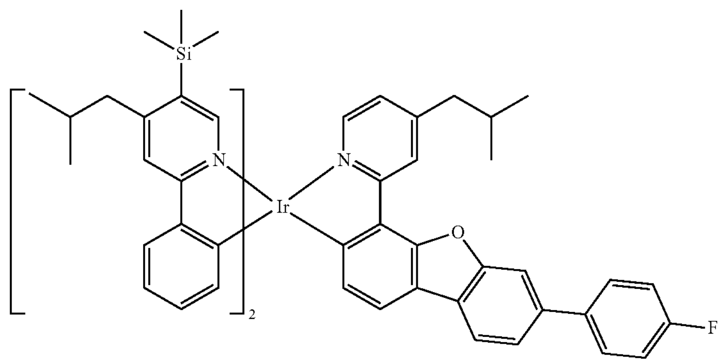
406
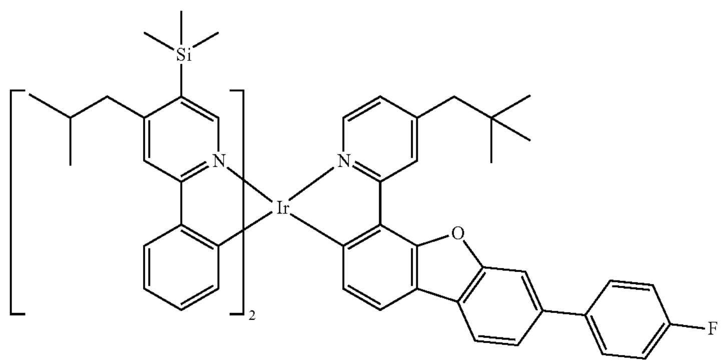

-continued
407
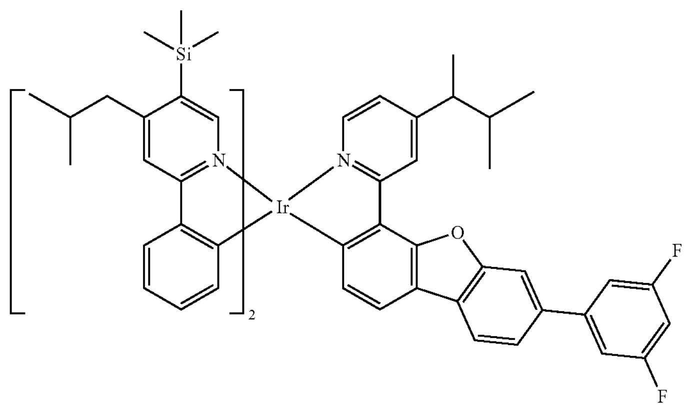
408
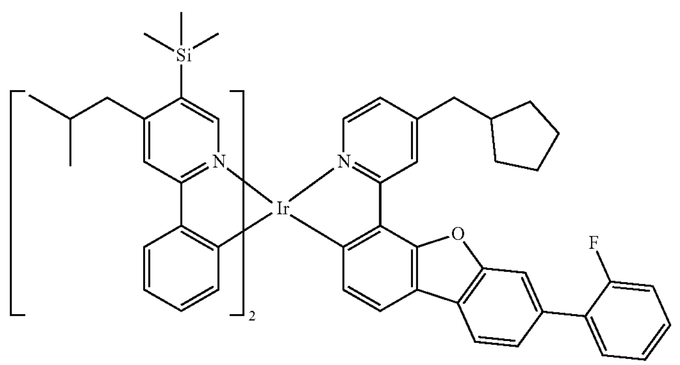
409
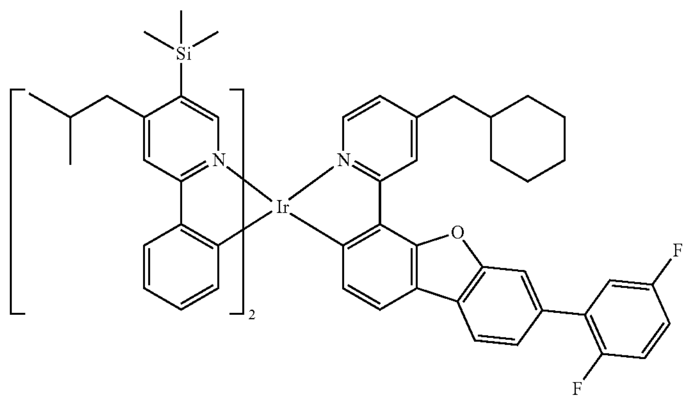
410
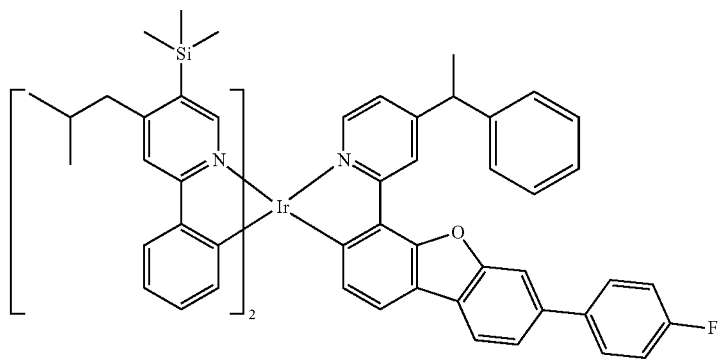

-continued
411
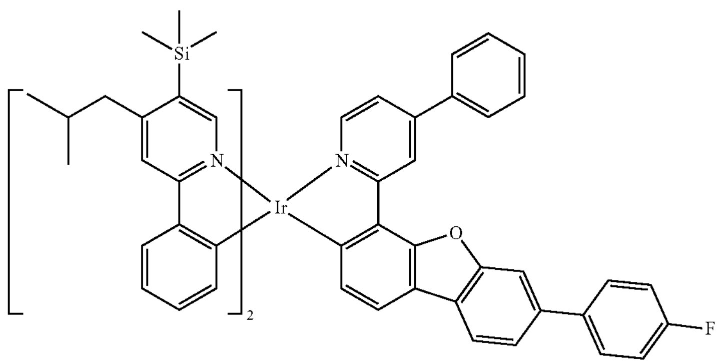
412
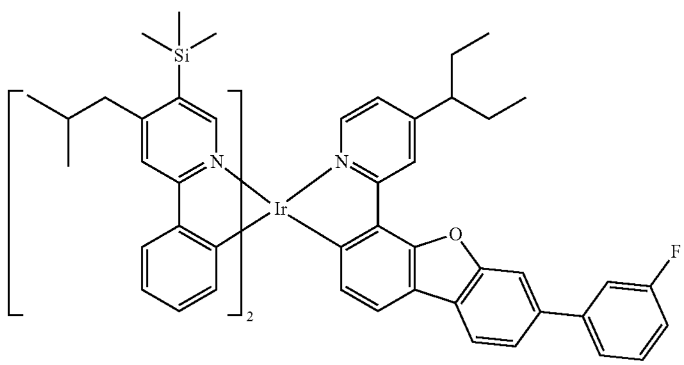
413
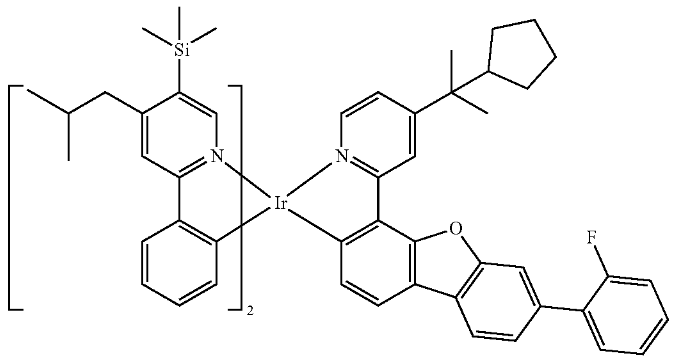
414
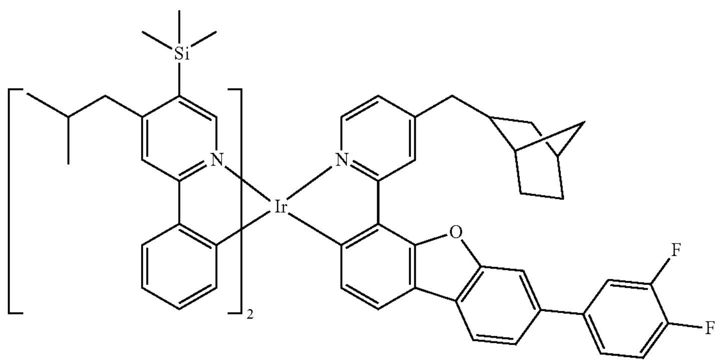

-continued
415
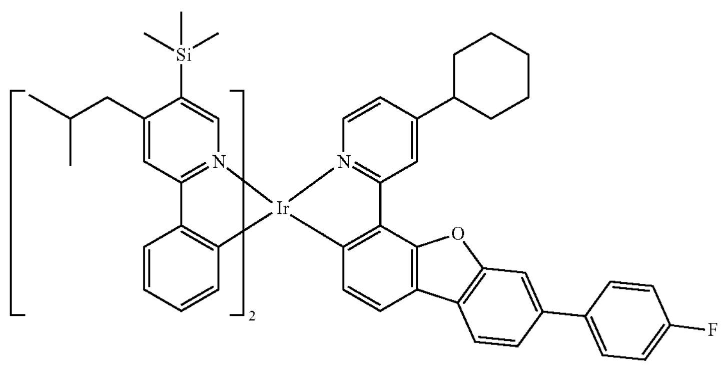
416
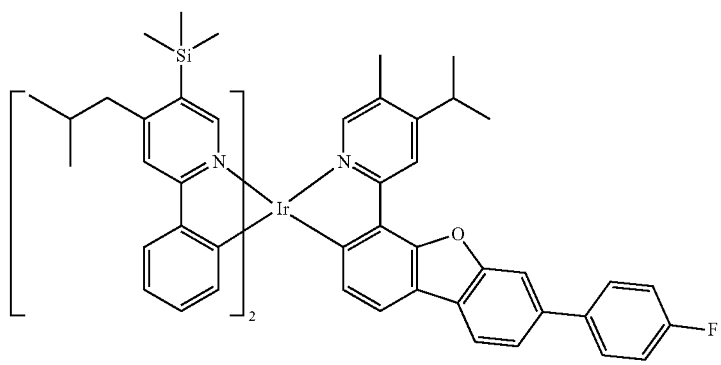
417
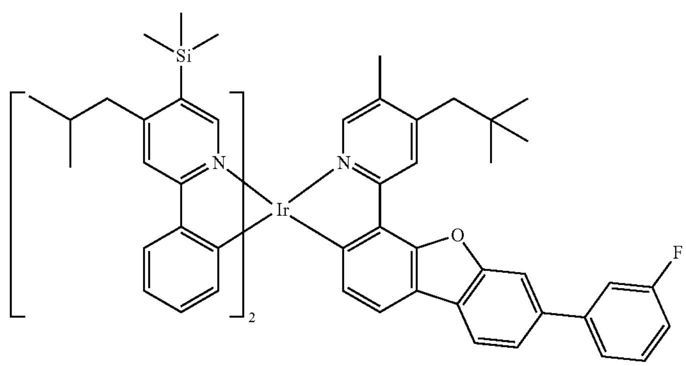
418
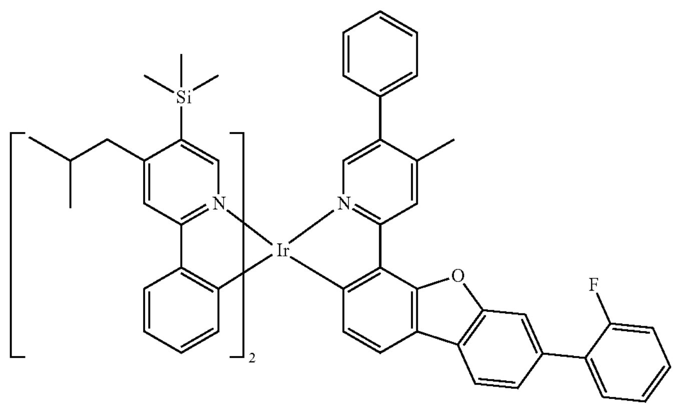

-continued
419
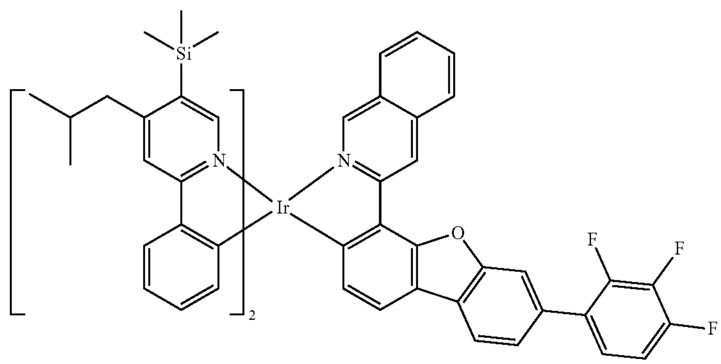
420
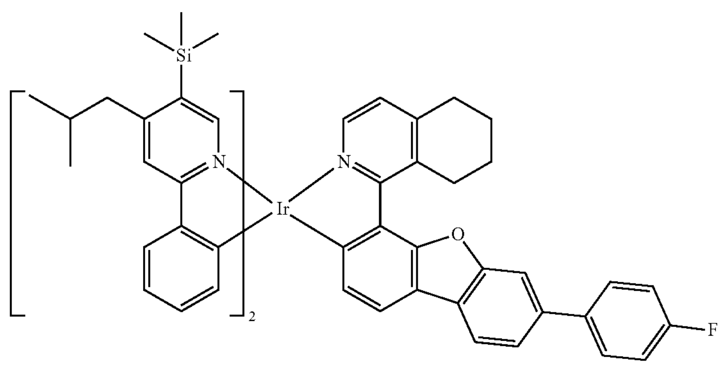
421
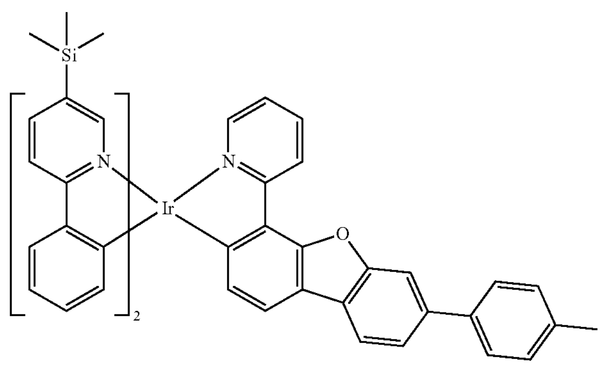
422
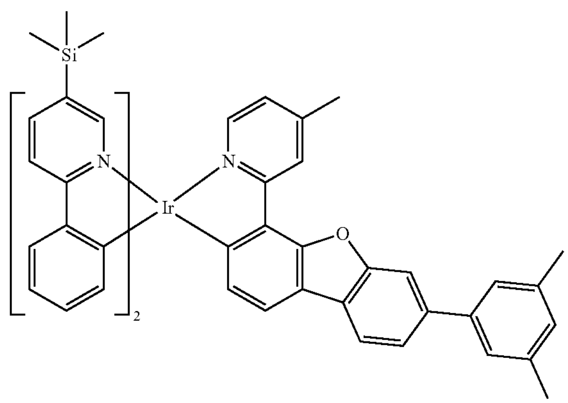

-continued
423
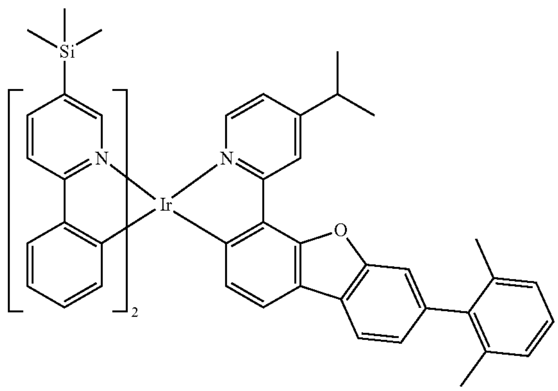
424
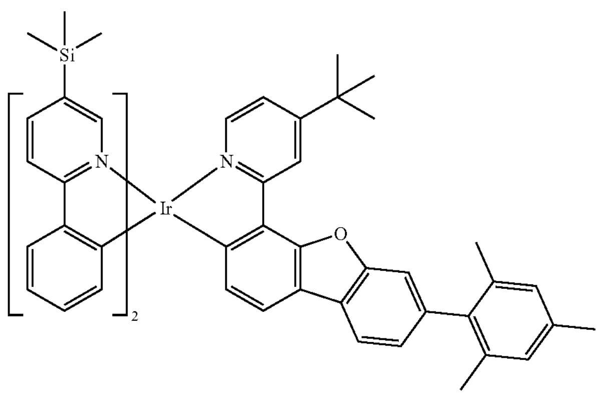
425
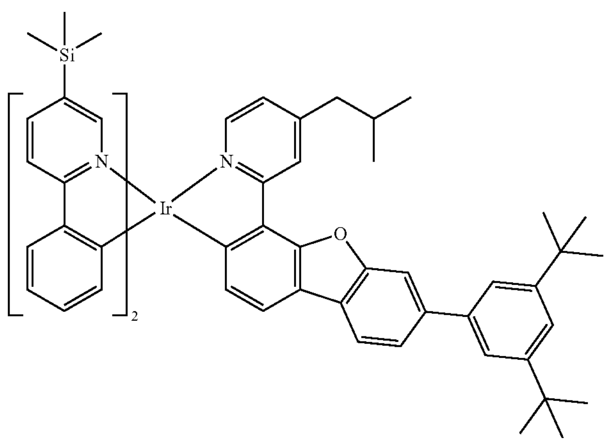
426
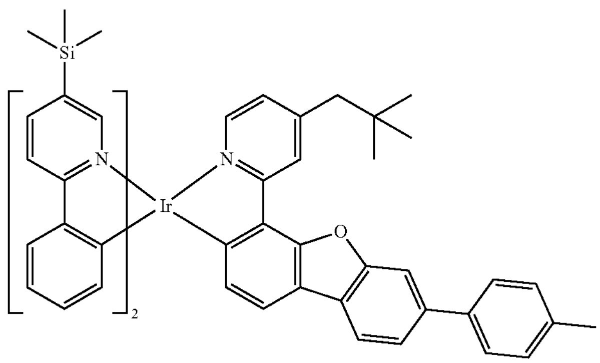

-continued
427
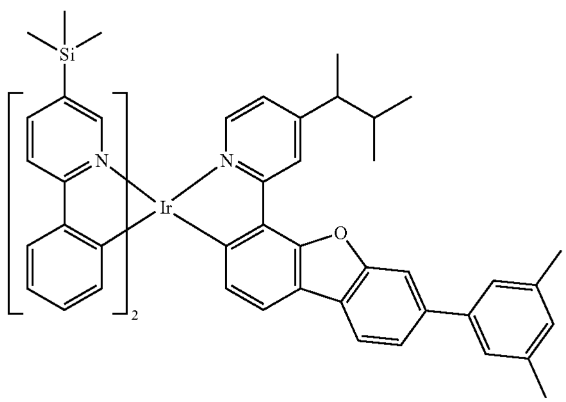
428
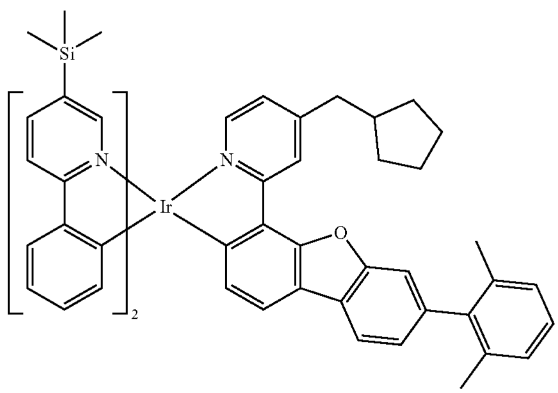
429
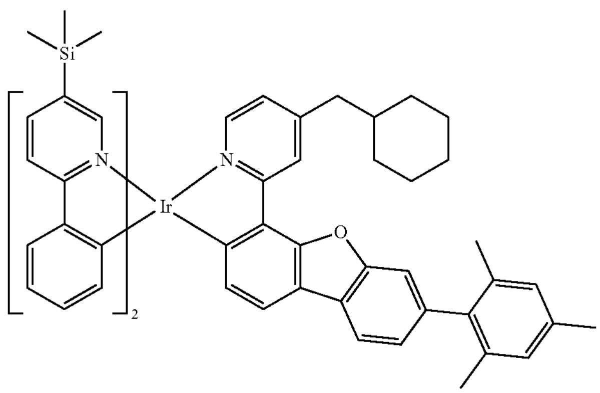
430
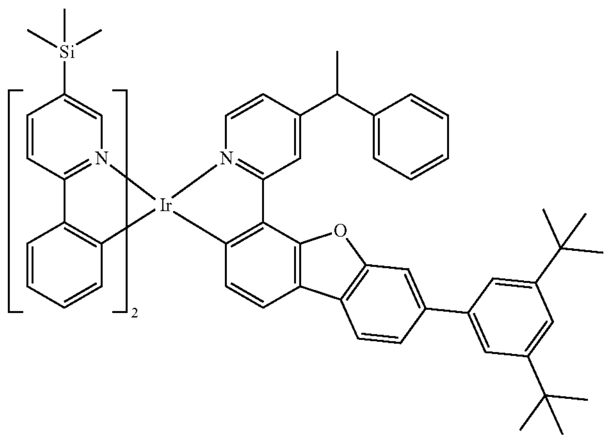

-continued
431
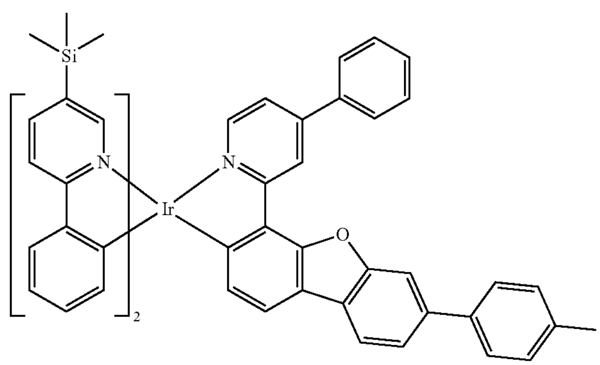
432
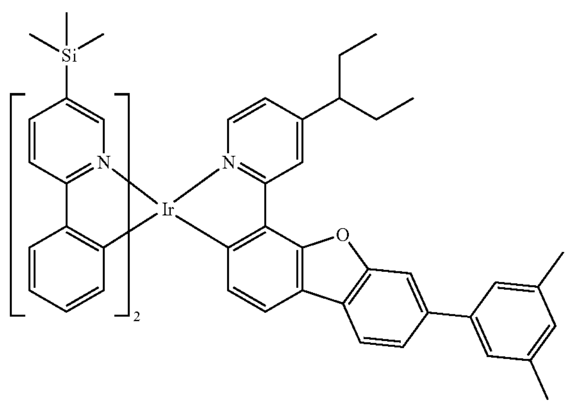
433
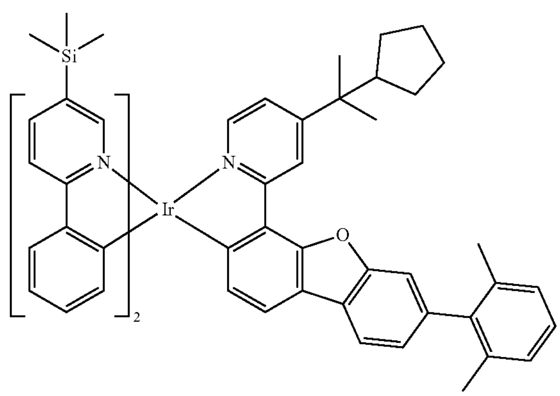
434
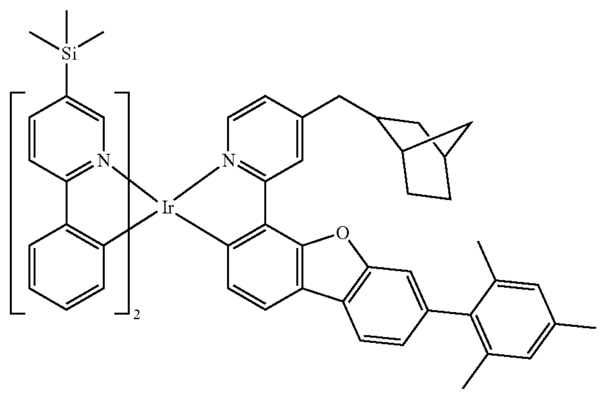

-continued
435
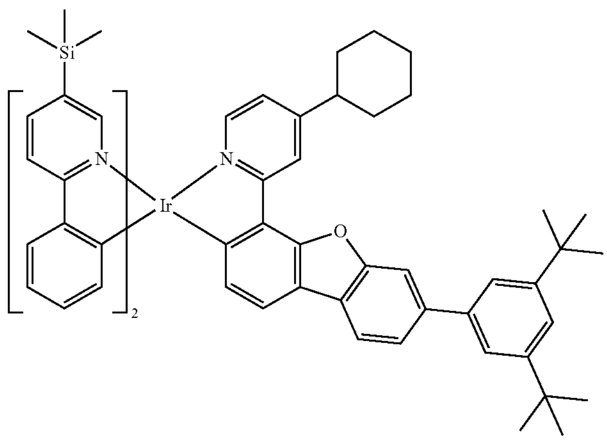
436
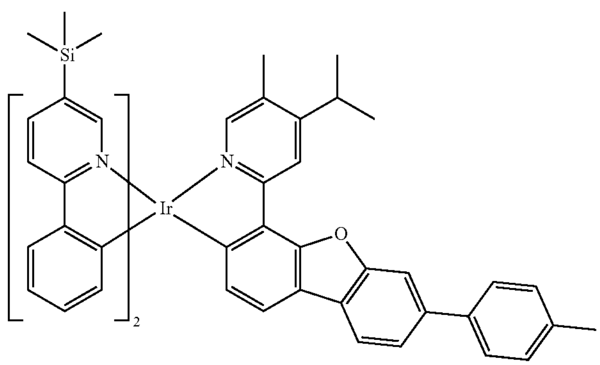
437
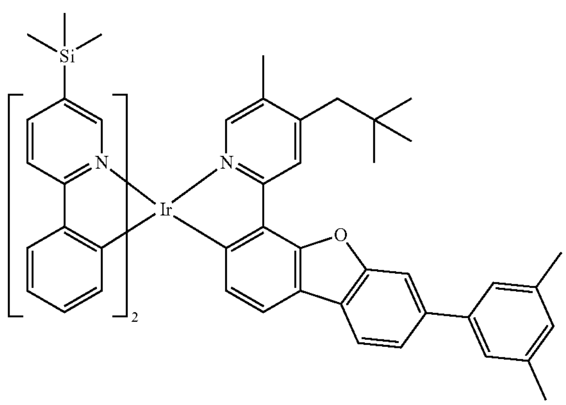
438
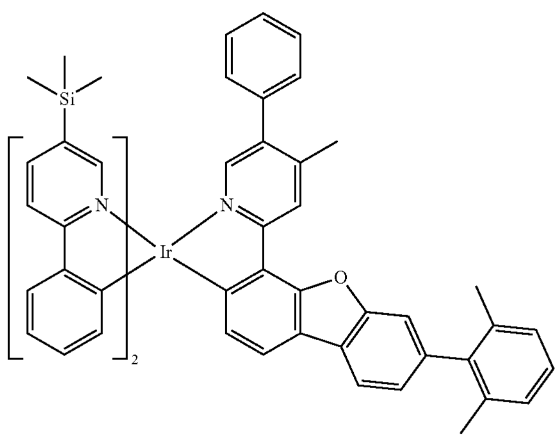

-continued
439
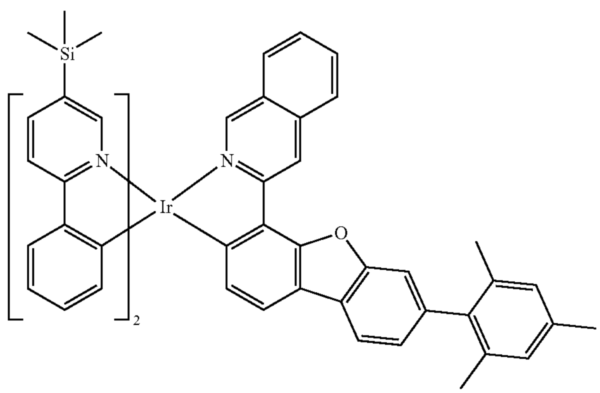
440
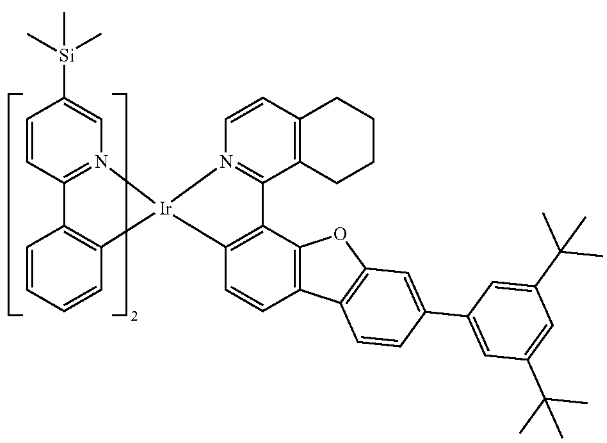
441
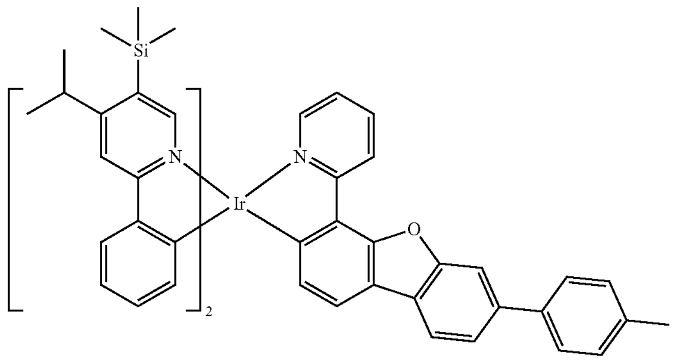
442
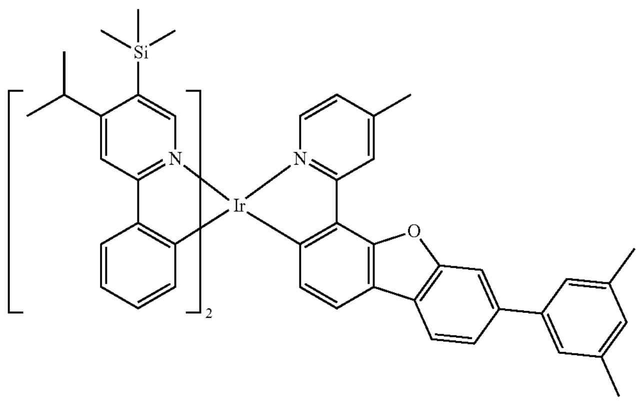

-continued
443
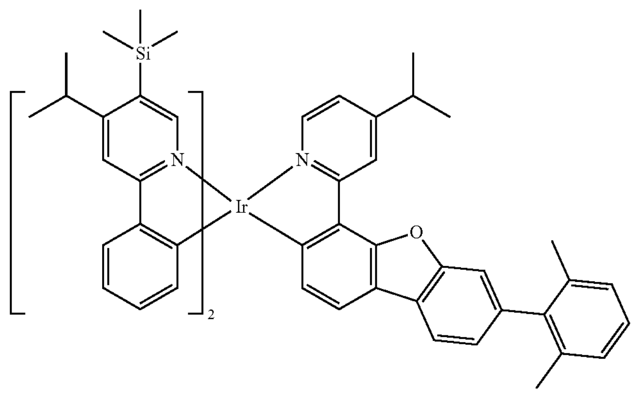
444
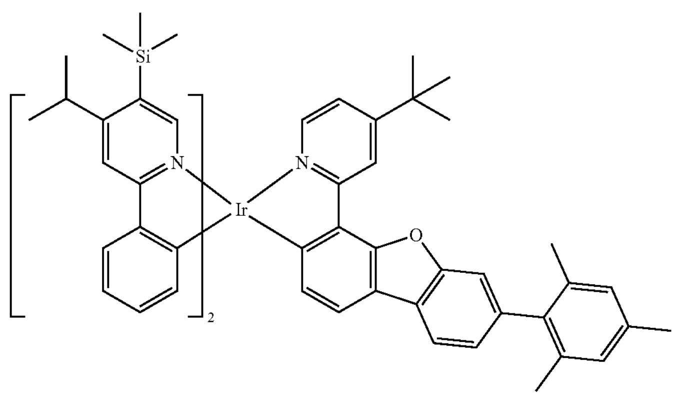
445
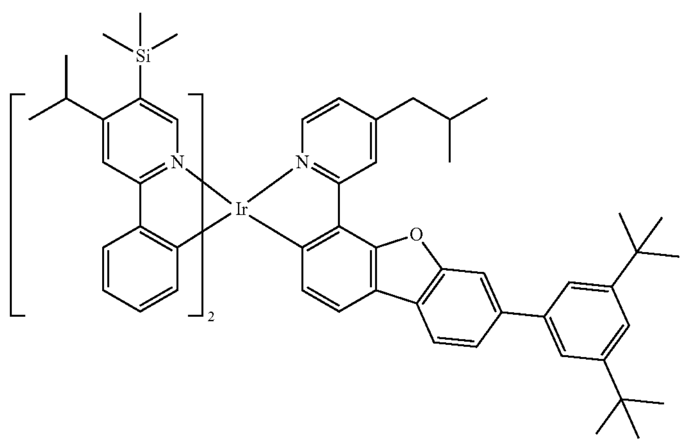
446
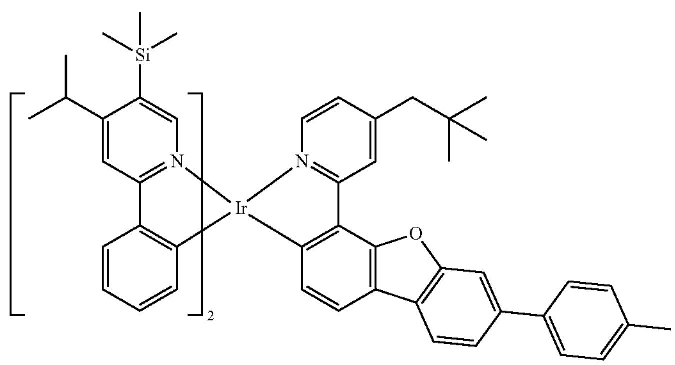

-continued
447
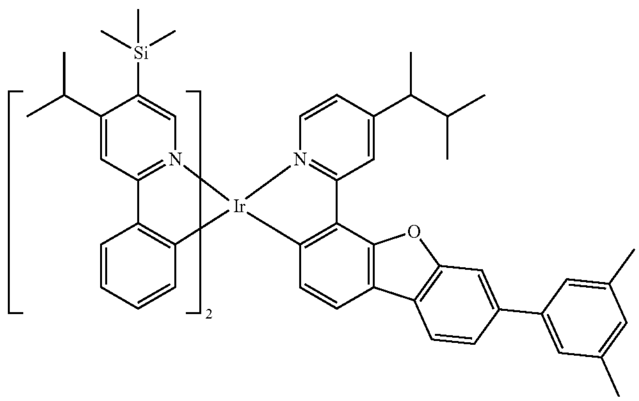
448
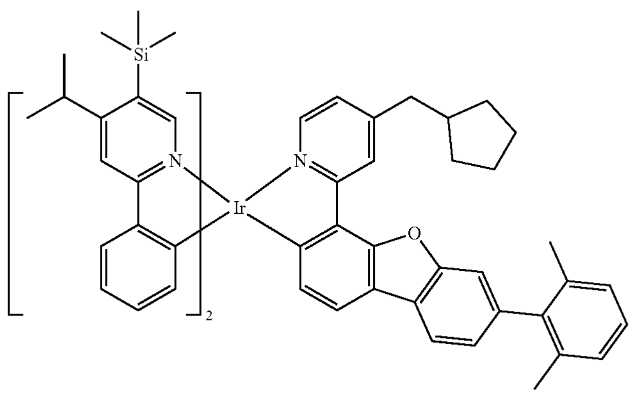
449
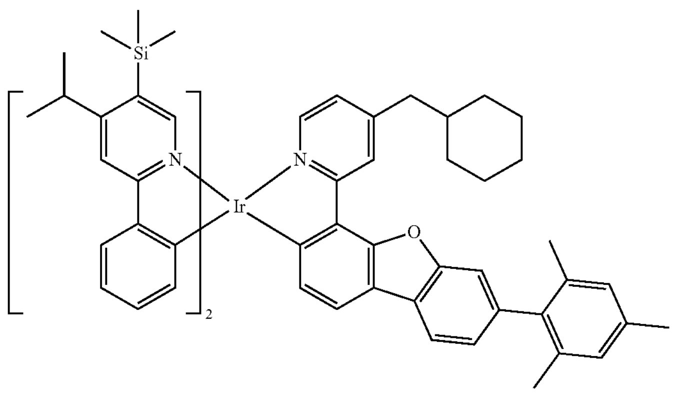
450
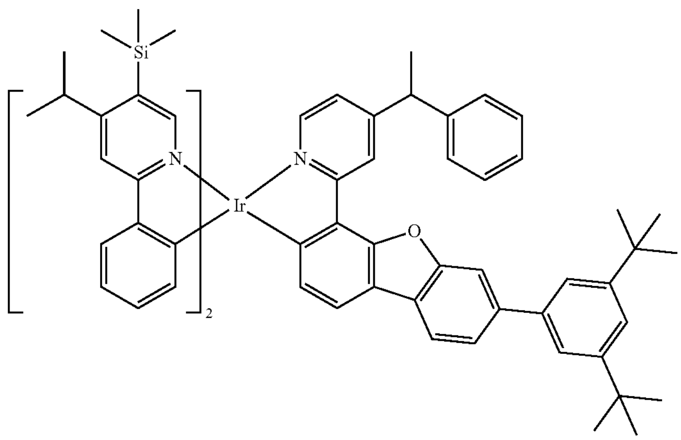

-continued
451
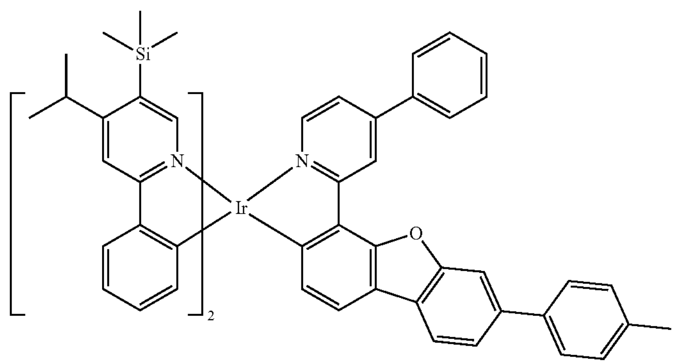
455
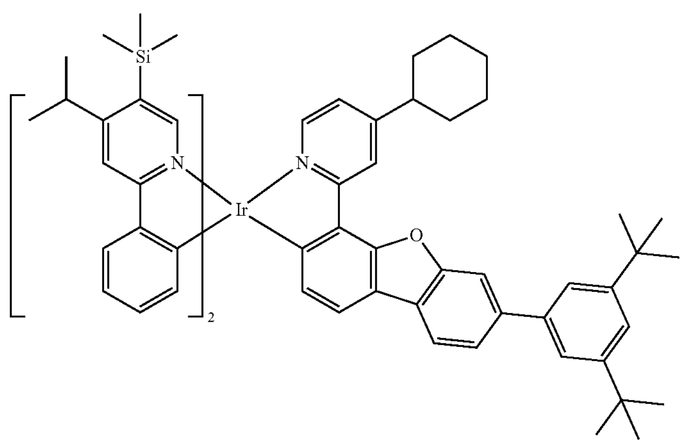
456
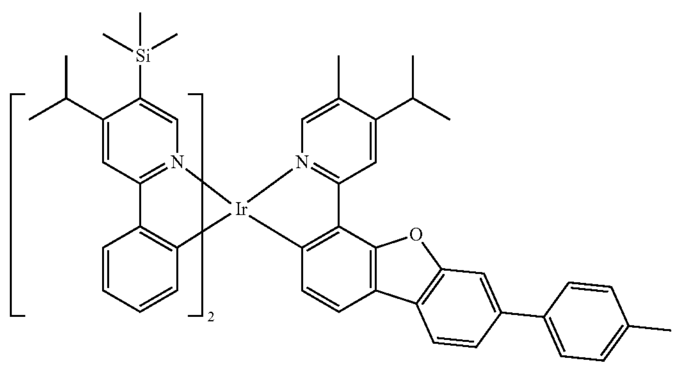
457
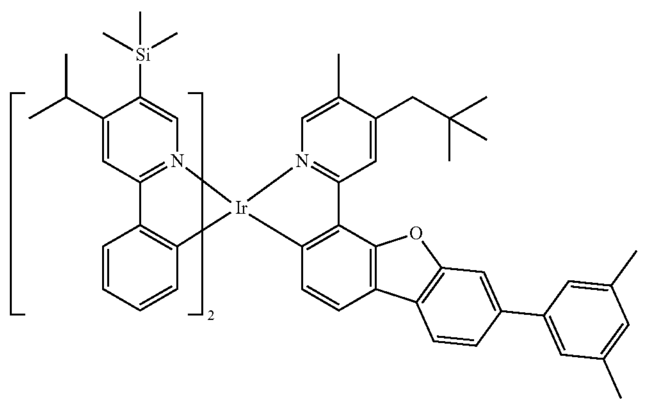

-continued
458
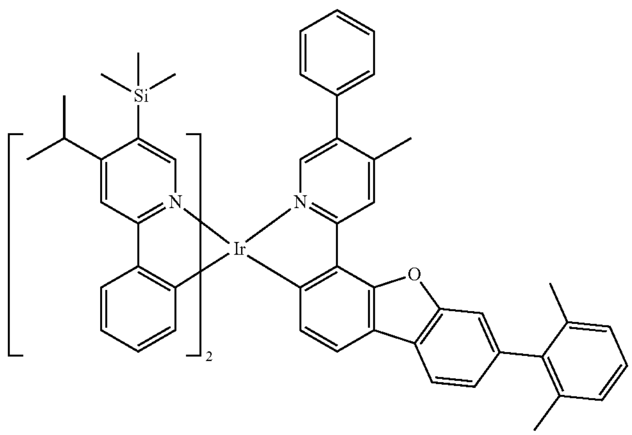
459
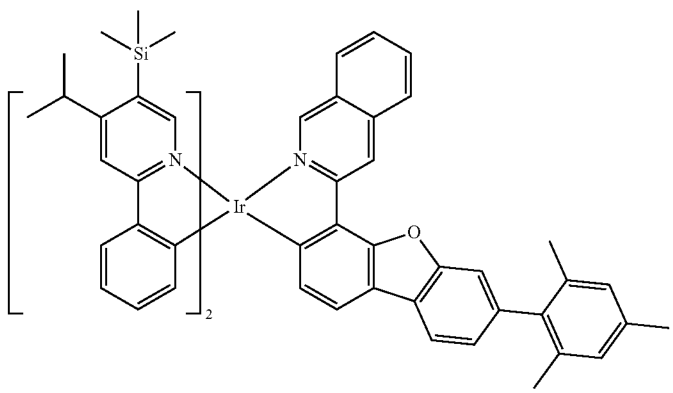
460
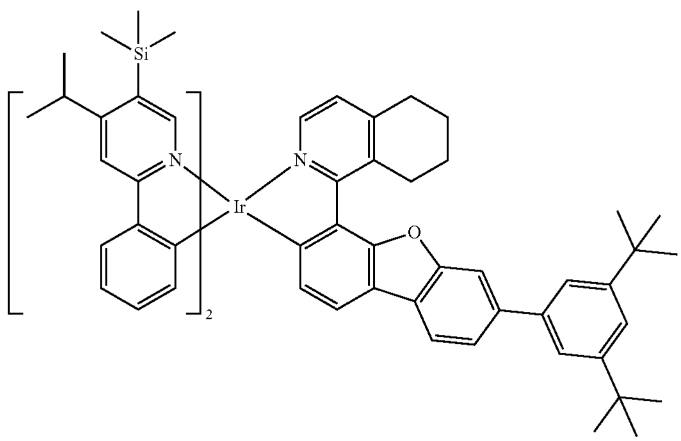
461
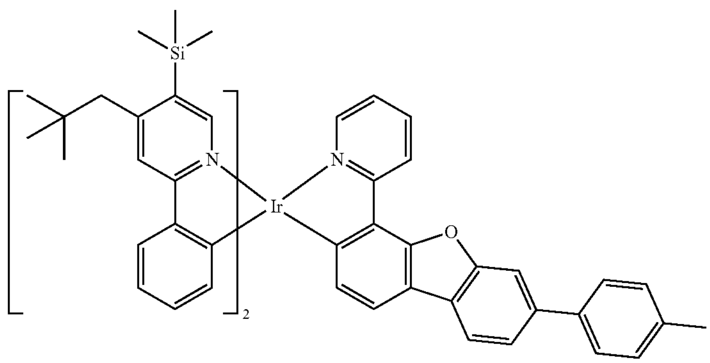

-continued
462
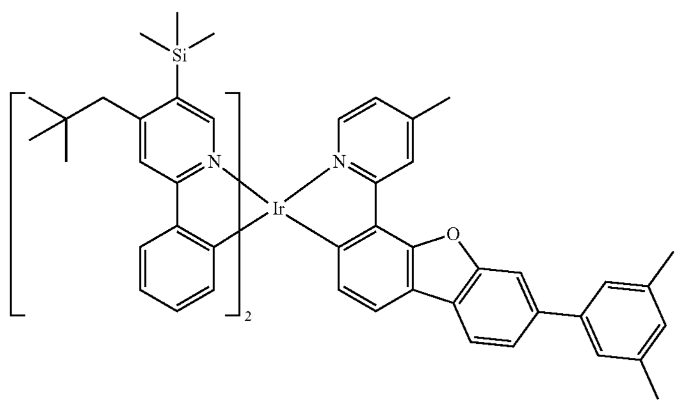
463
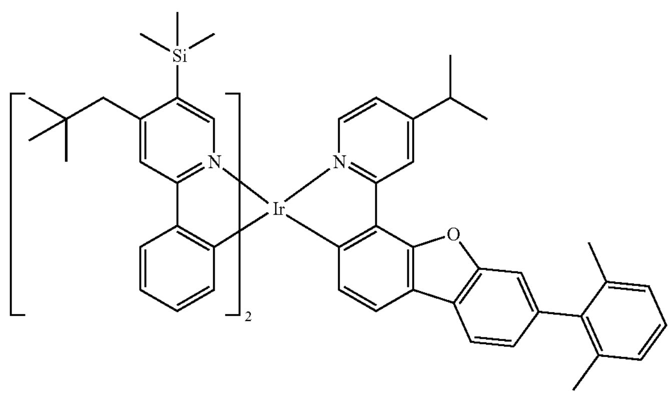
464
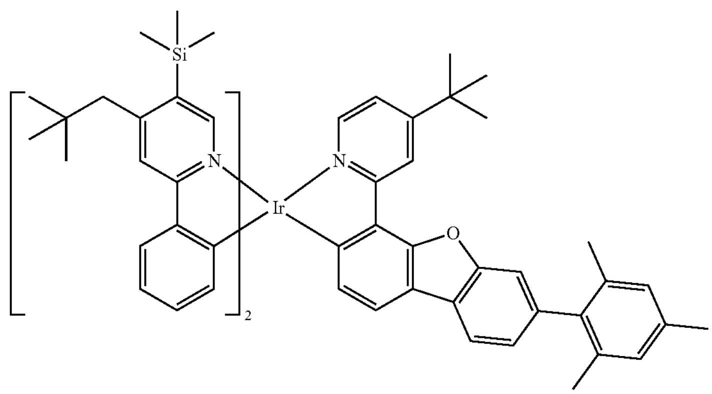
465
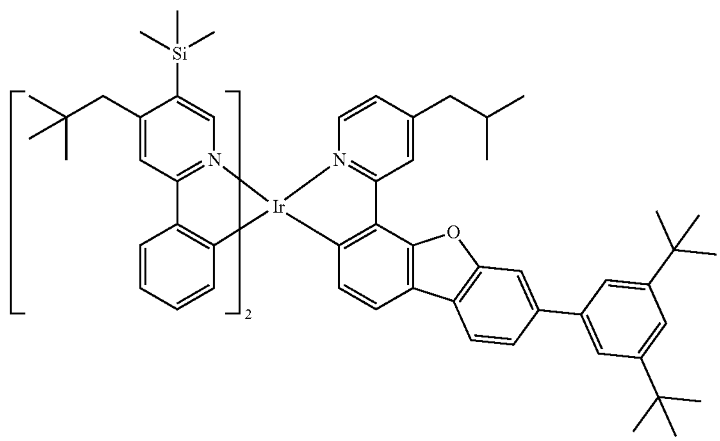

-continued
466
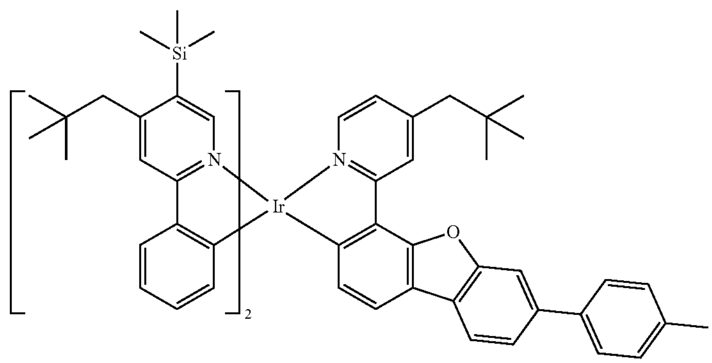
467
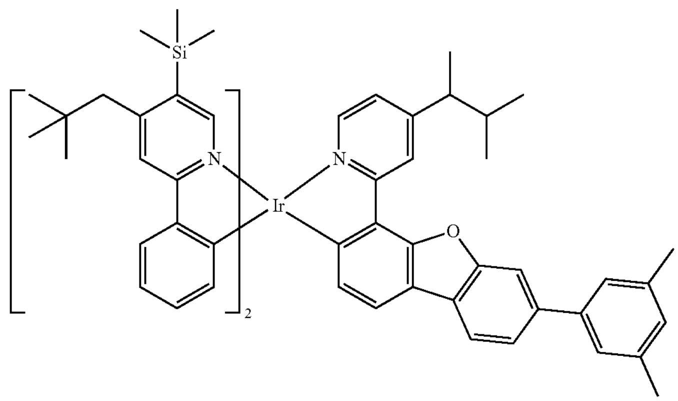
468
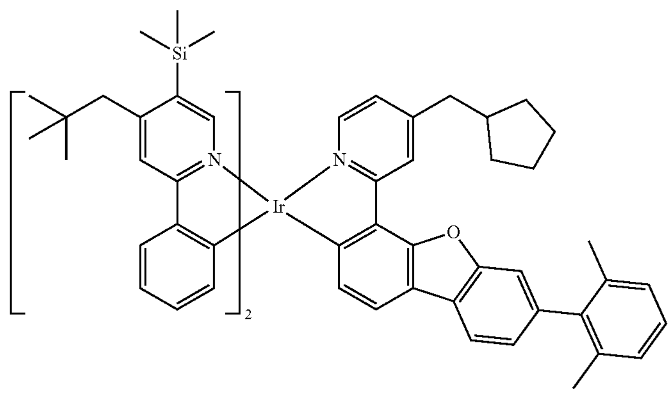
469
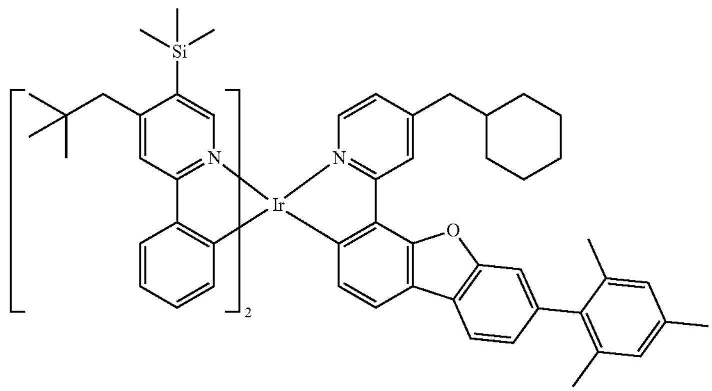

-continued
470
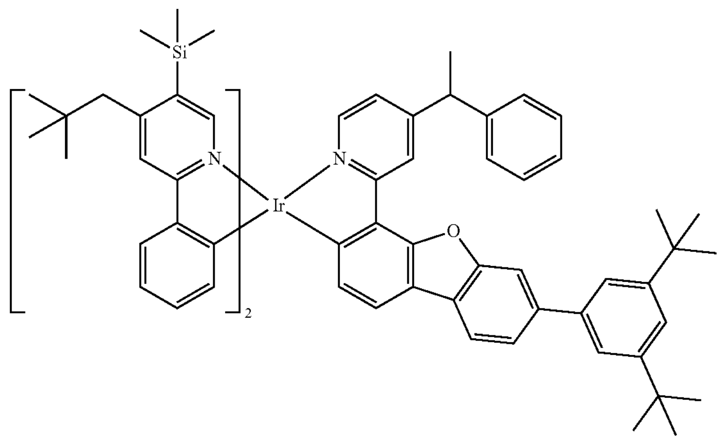
471
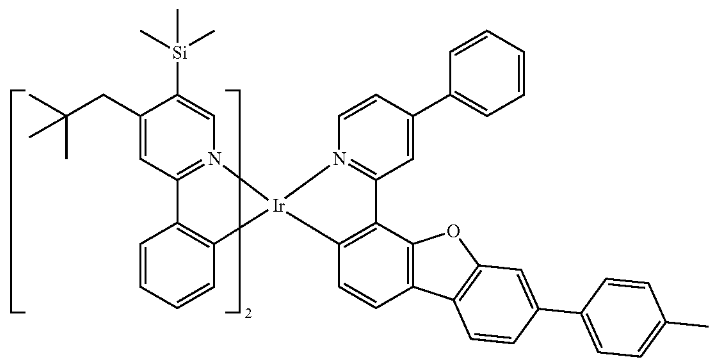
472
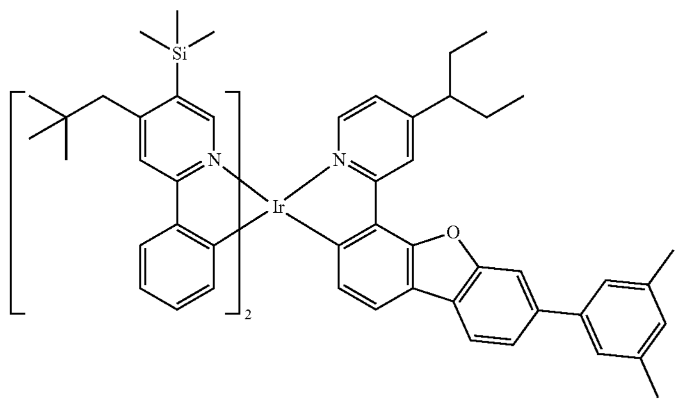
473
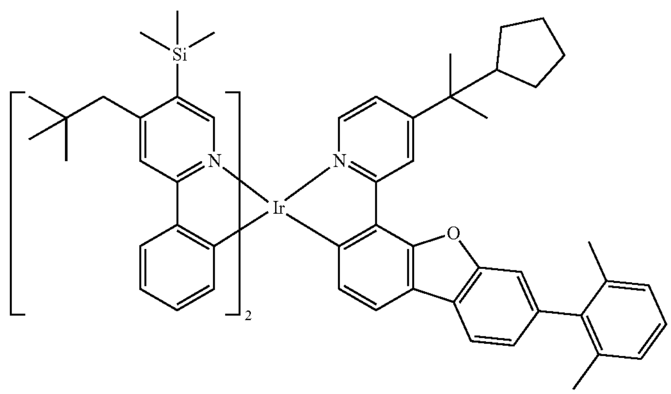

-continued
474
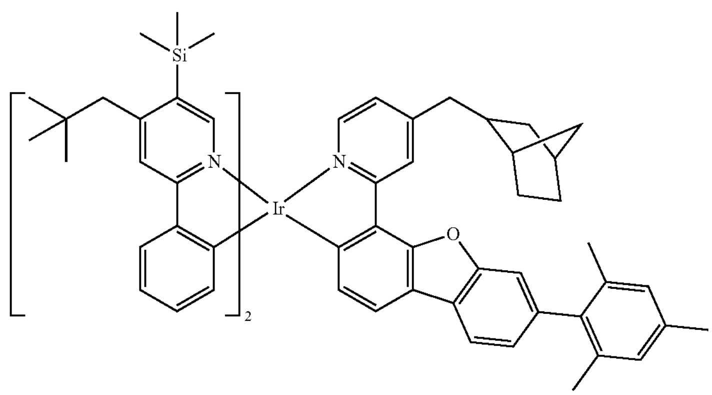
475
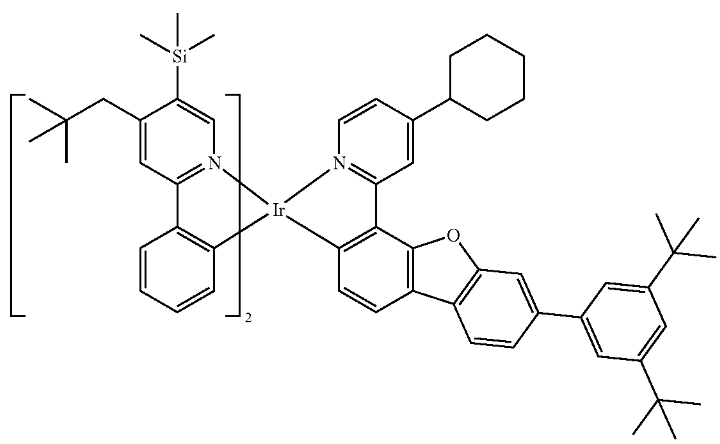
476
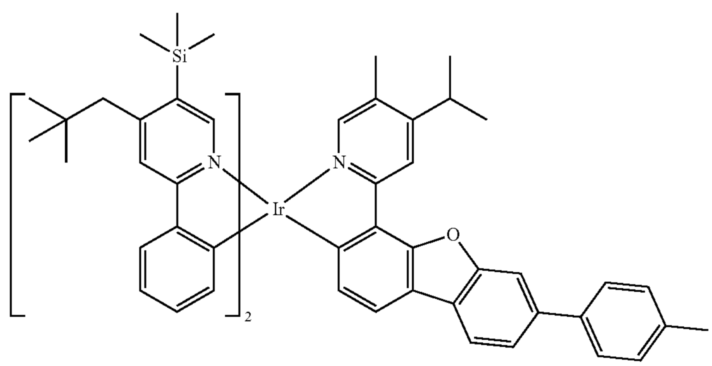
477
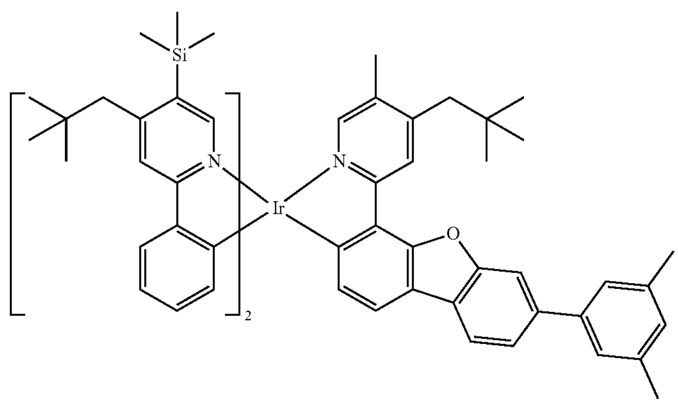

-continued
478
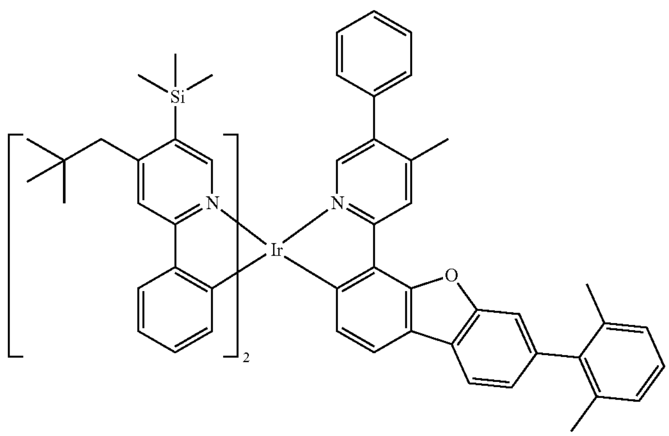
479
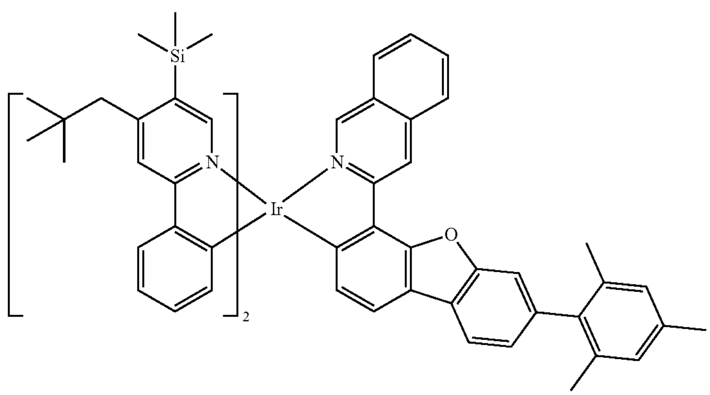
480
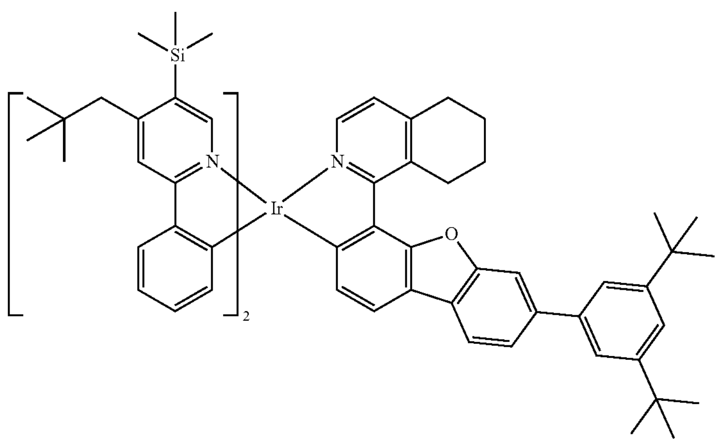

-continued
481
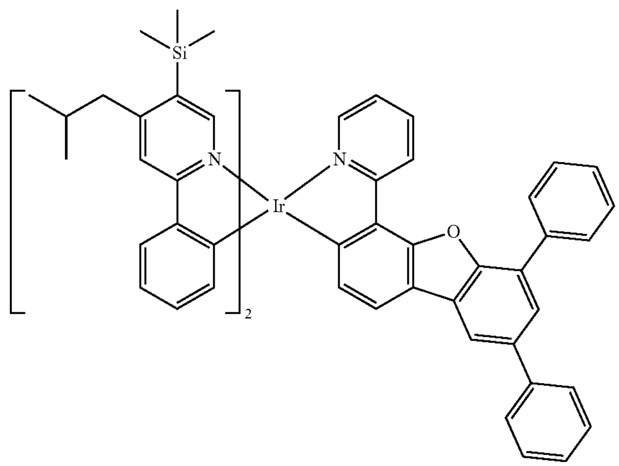
482
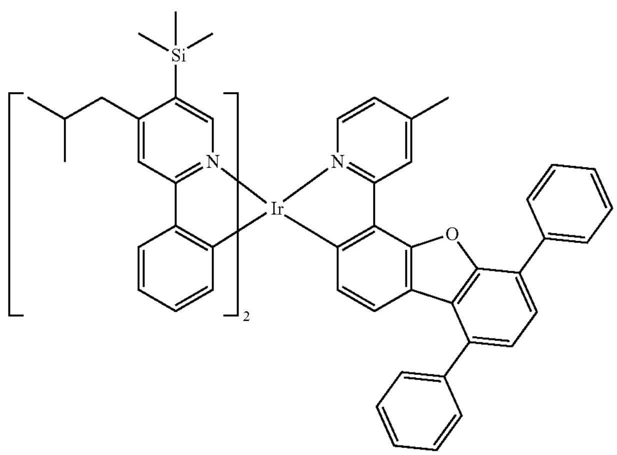
483
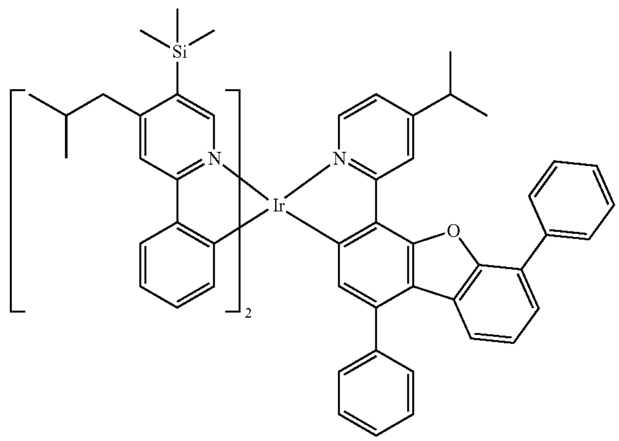

-continued
484
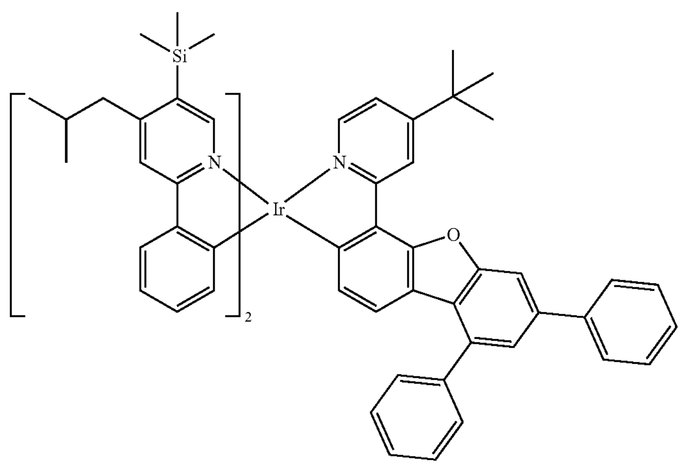
485
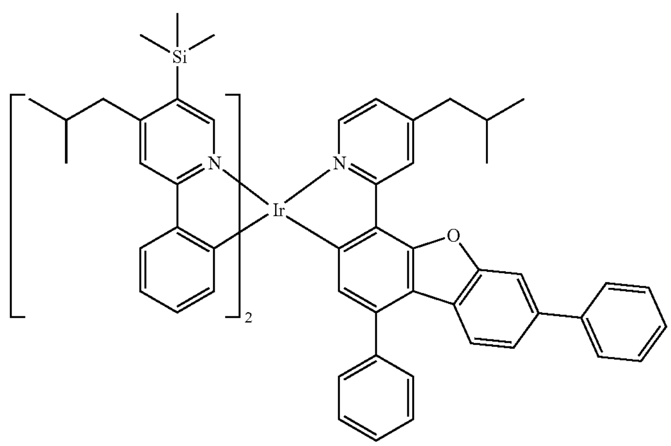
486
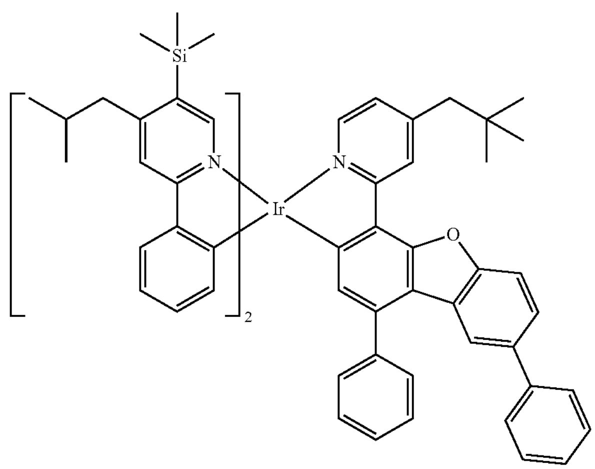

-continued
487
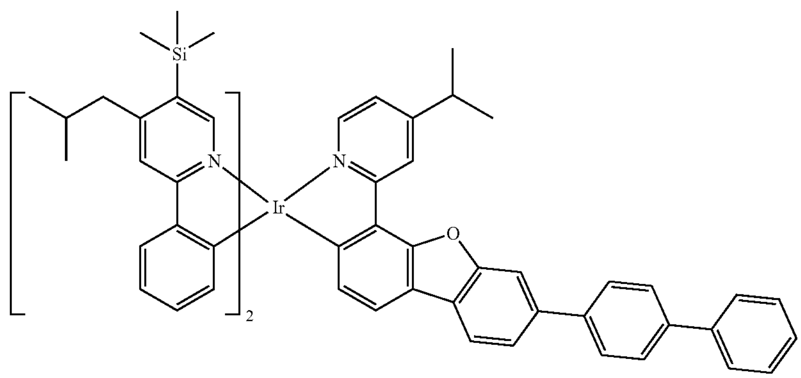
488
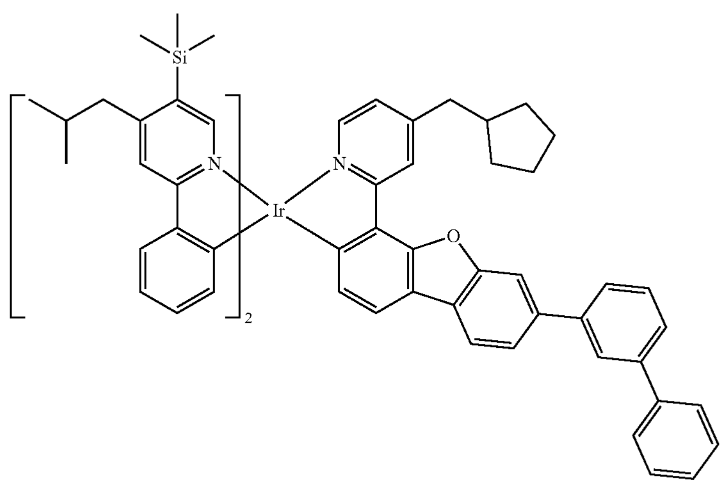
489
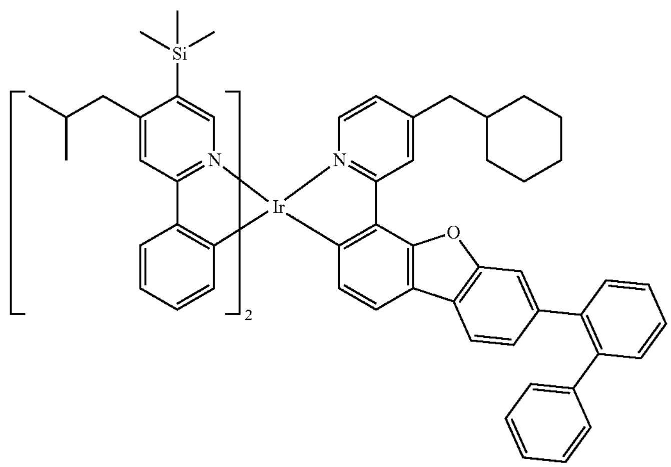

-continued
490
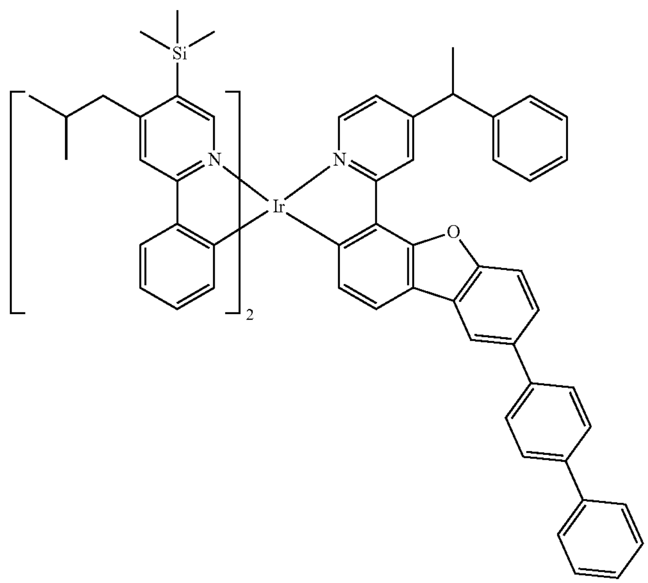
491
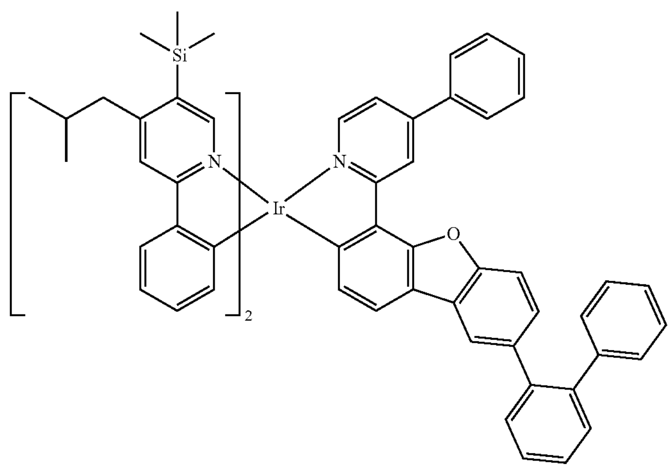
492
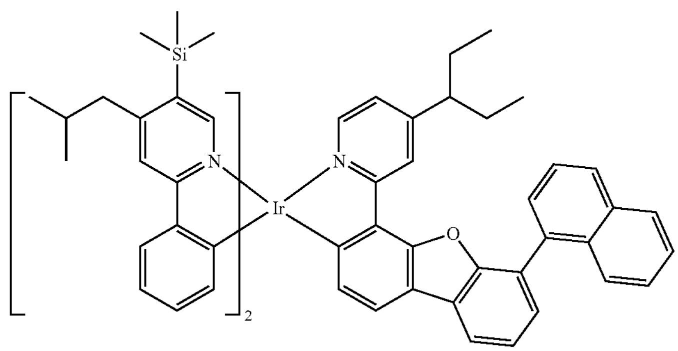

-continued
493
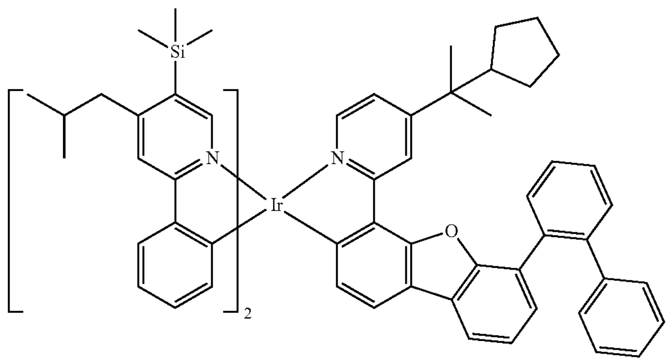
494
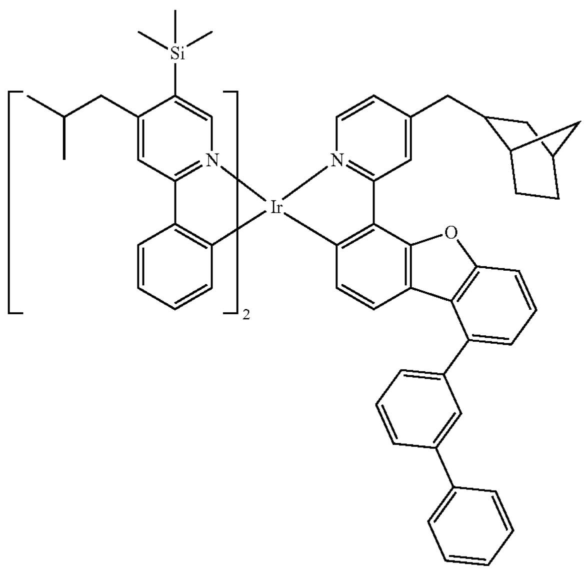
495
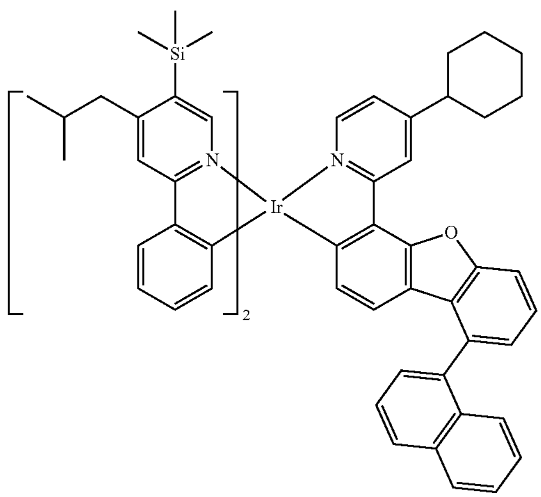

-continued
496
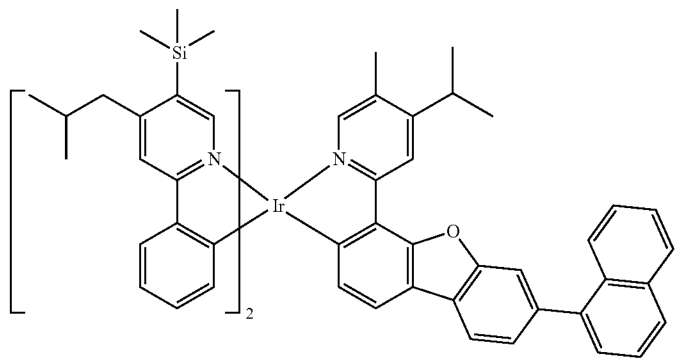
497
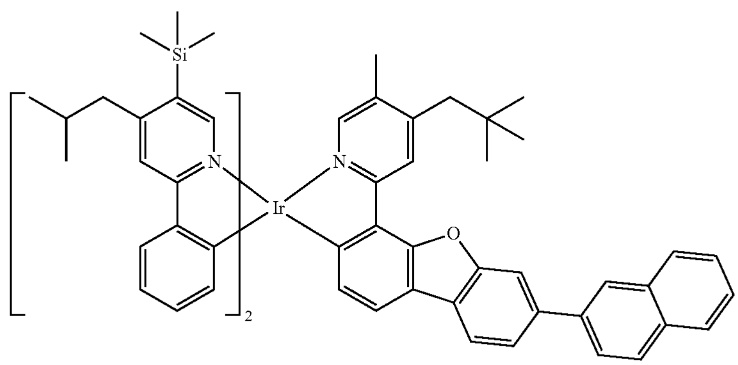
498
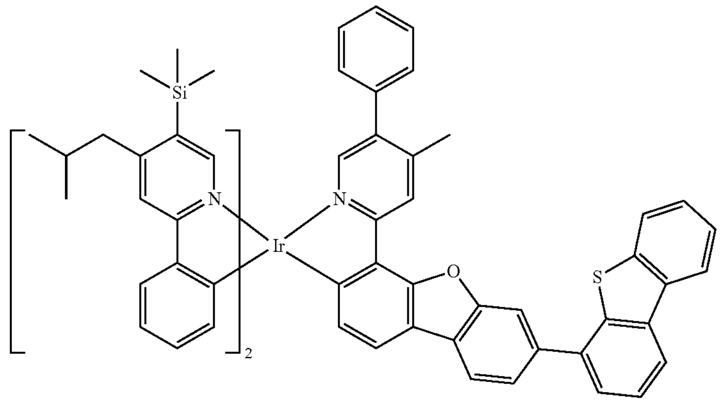
499
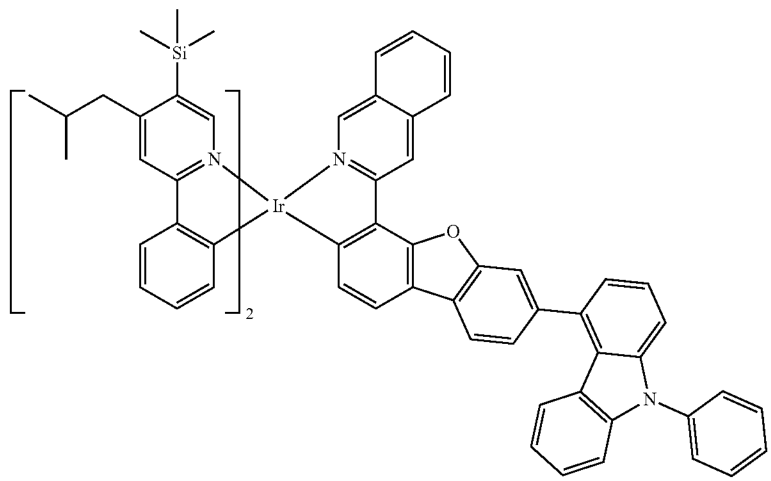

-continued
500
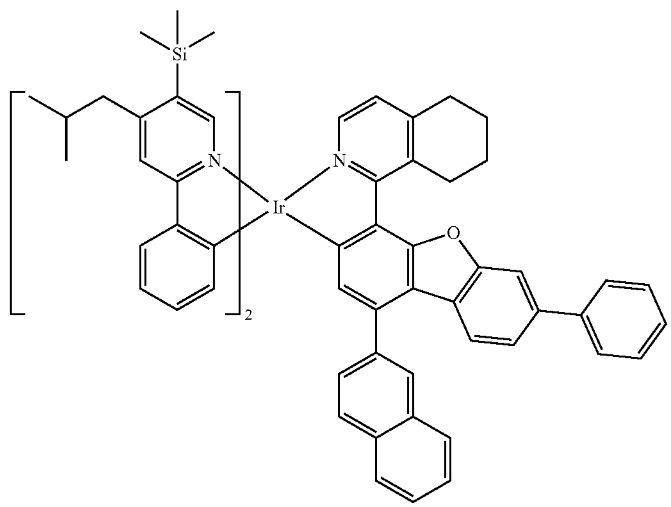
501
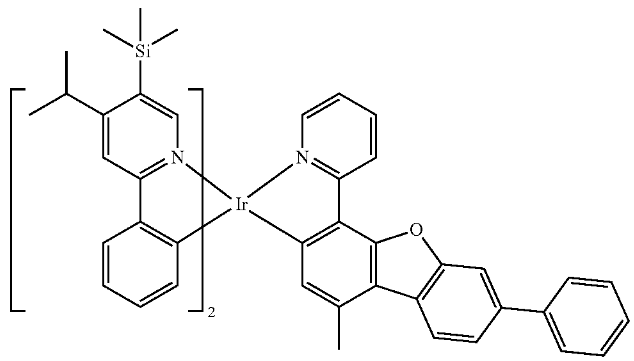
502
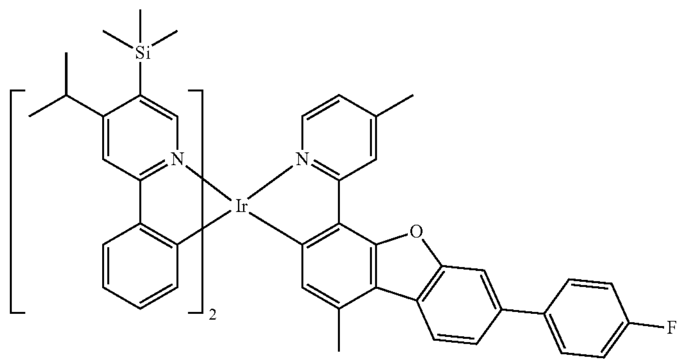
503
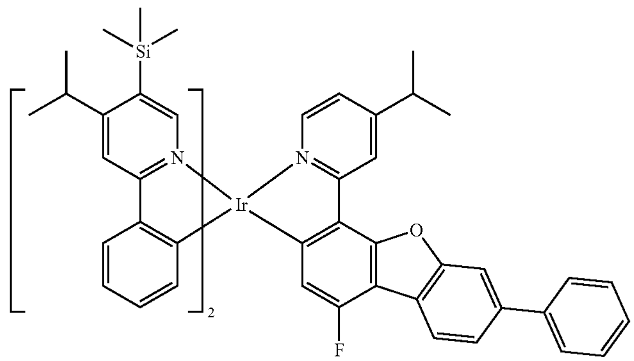

-continued
504
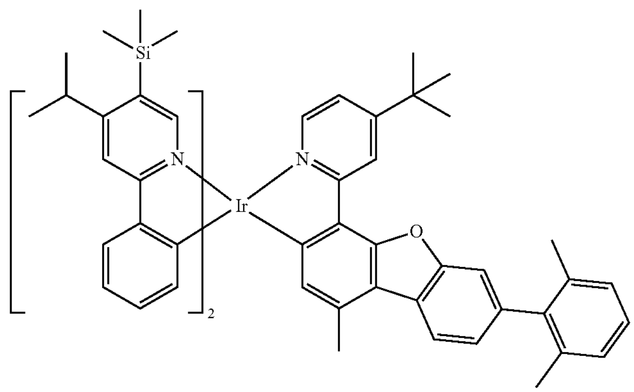
505
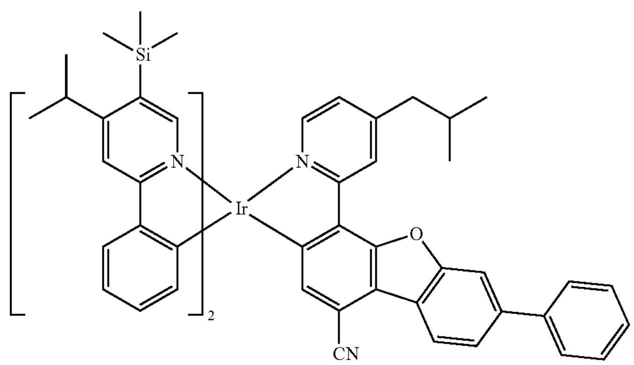
506
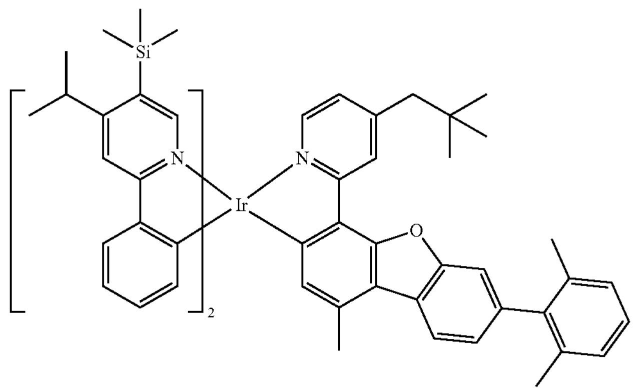
507
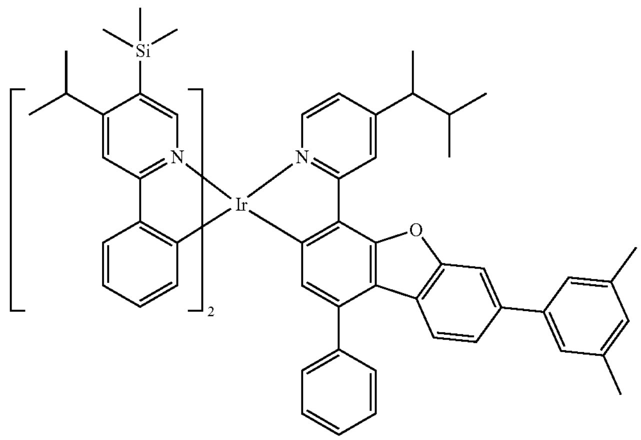

-continued
508
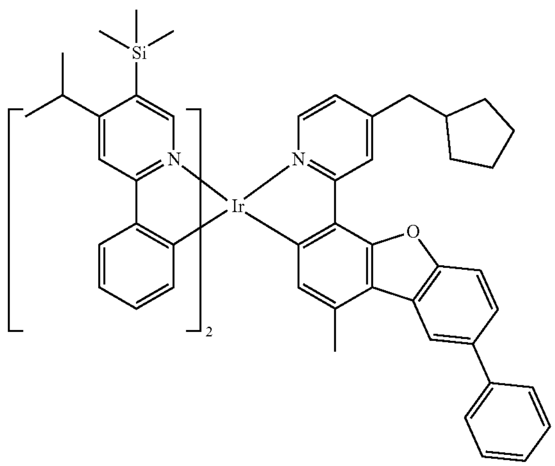
509
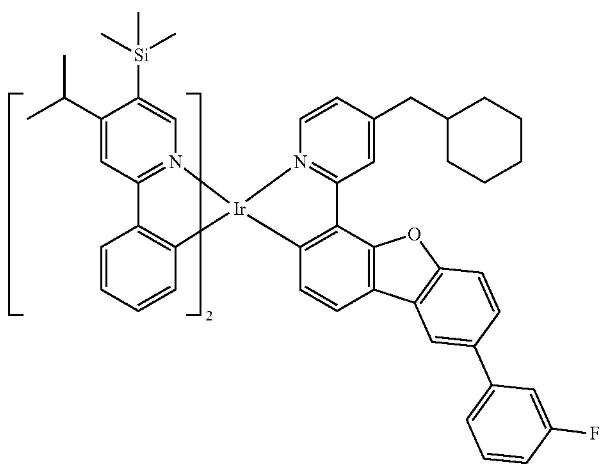
510
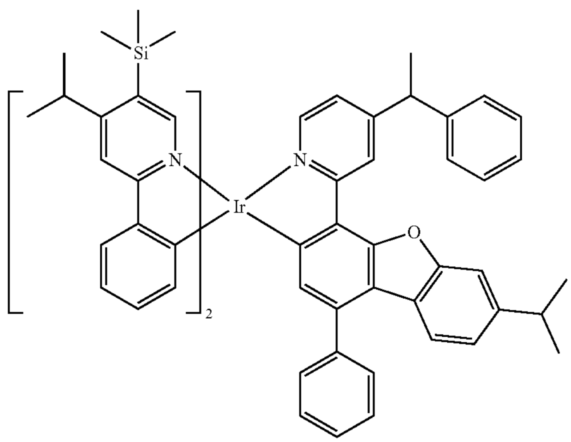

-continued
511
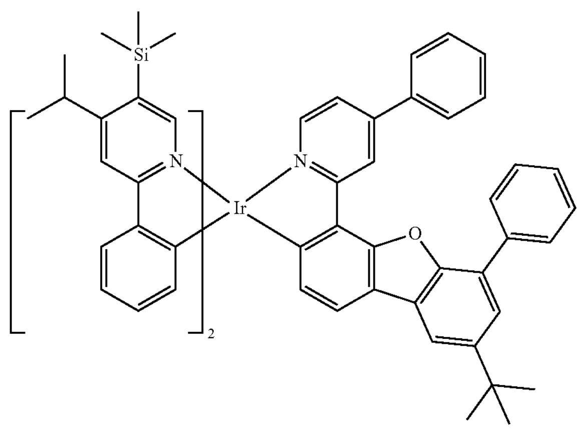
512
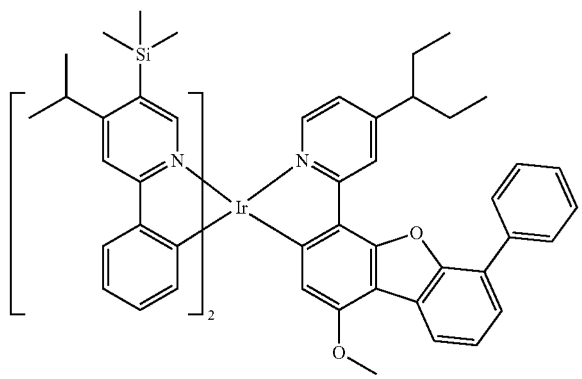
513
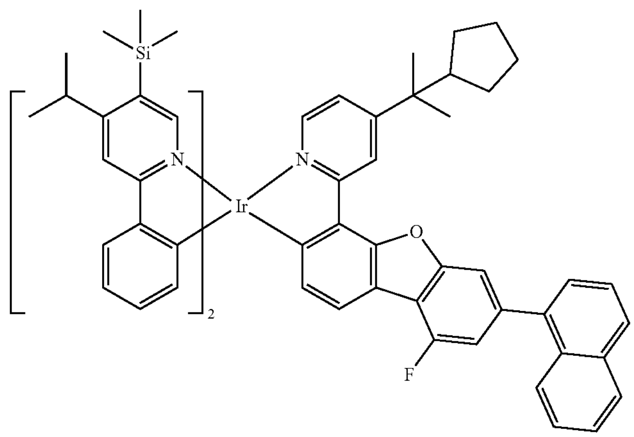

-continued
514
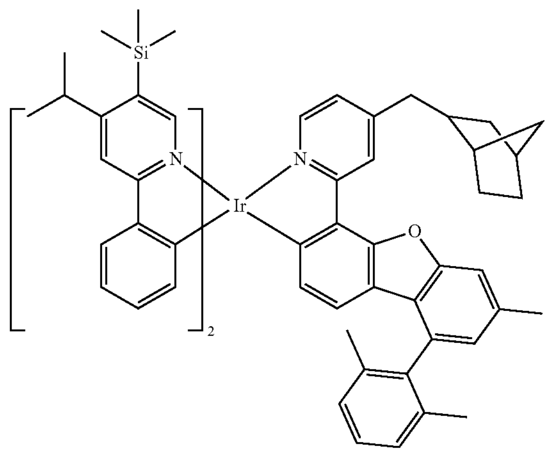
515
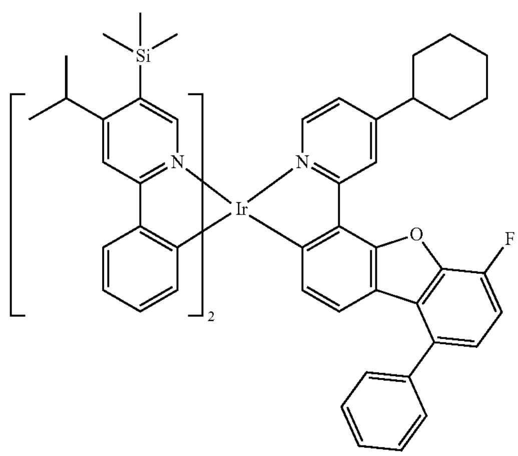
516
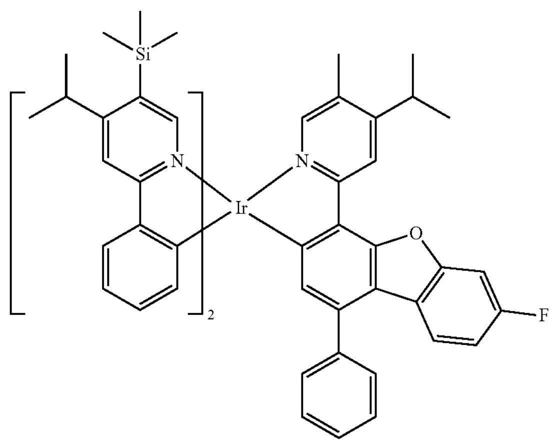

-continued
517
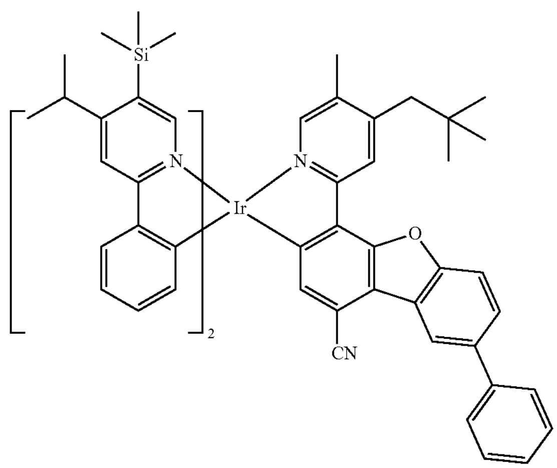
518
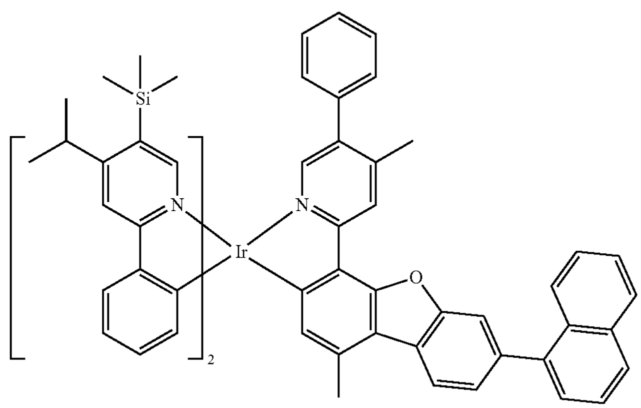
519
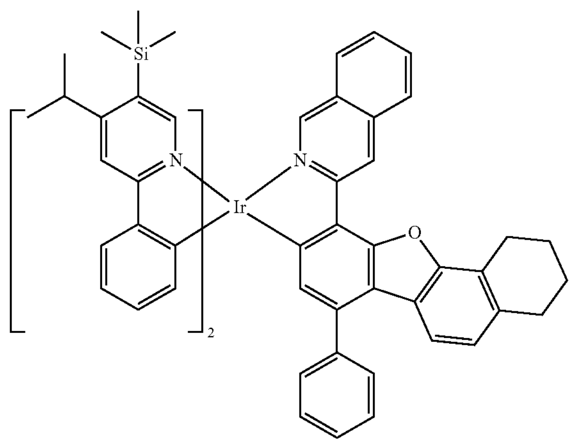

-continued
520
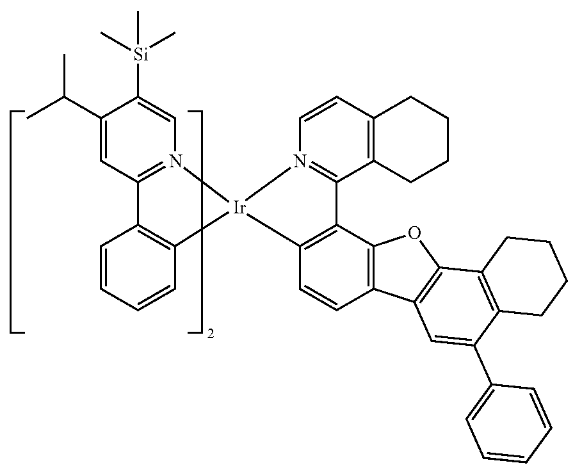
521
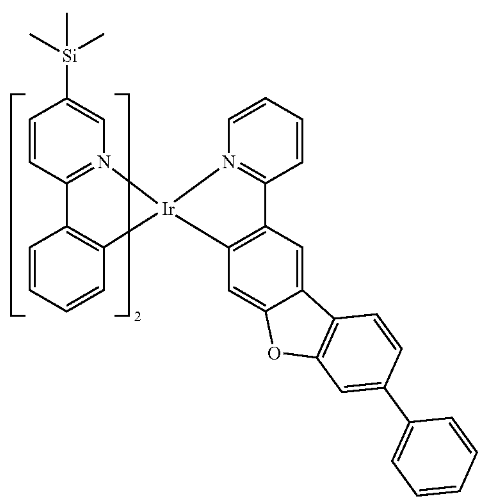
522
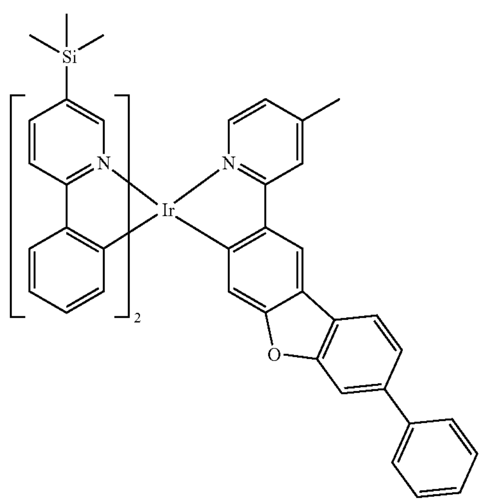

-continued
523
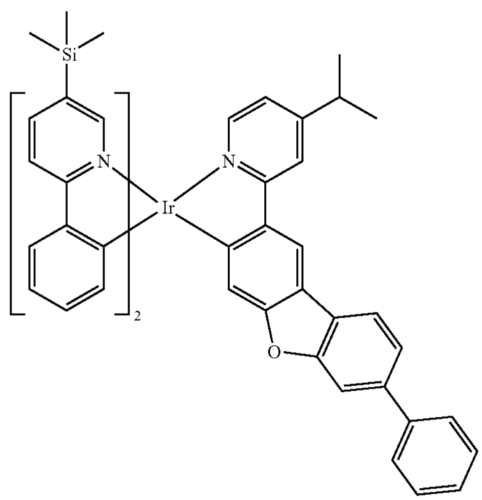
524
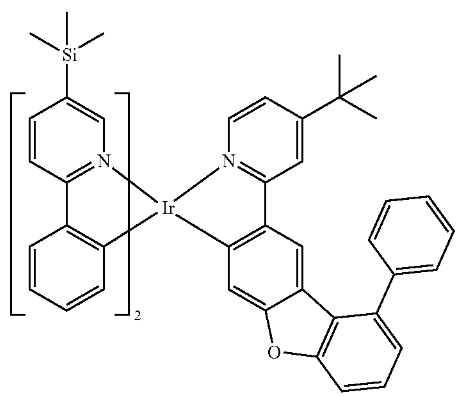
525
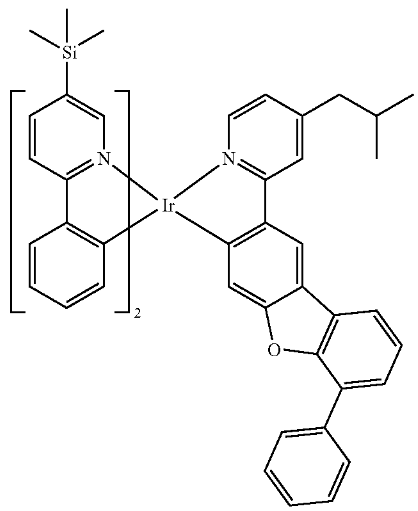

-continued
526
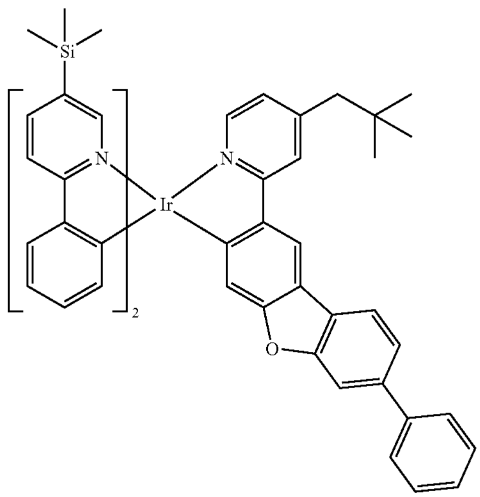
527
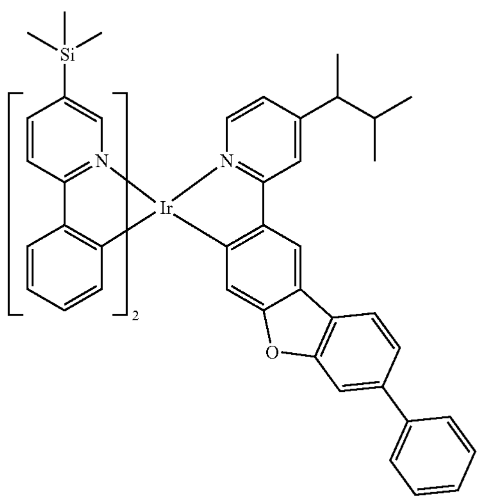
528
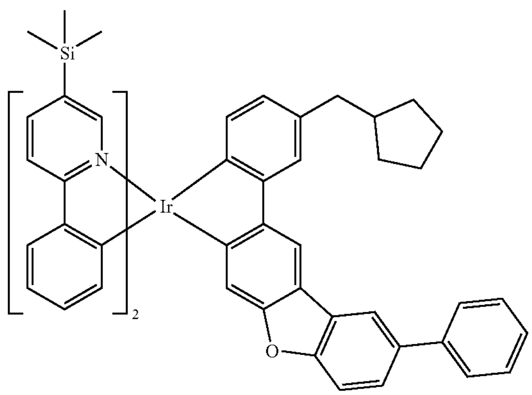

-continued
529
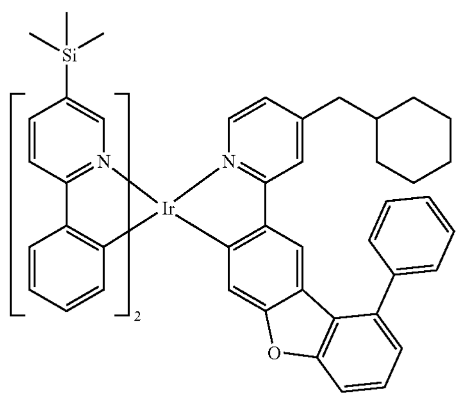
530
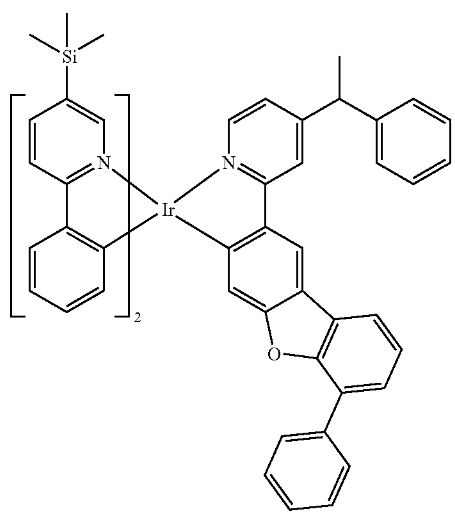
531
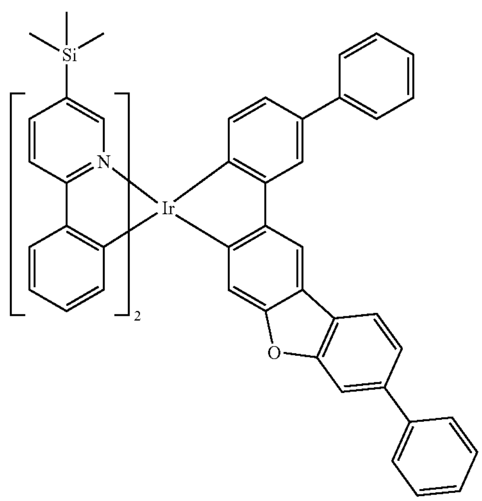

-continued
532
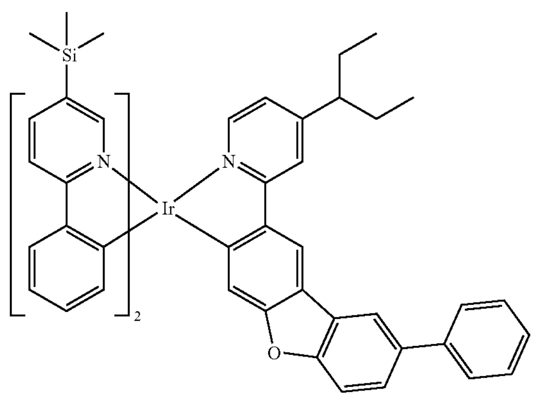
533
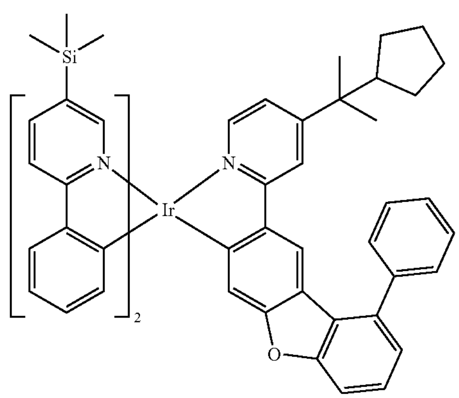
534
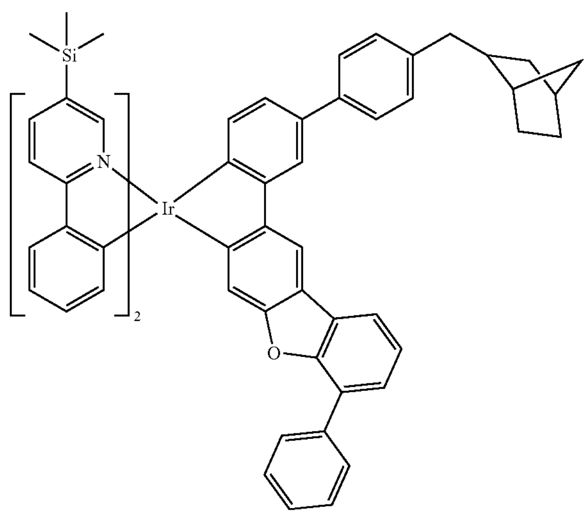

-continued
535
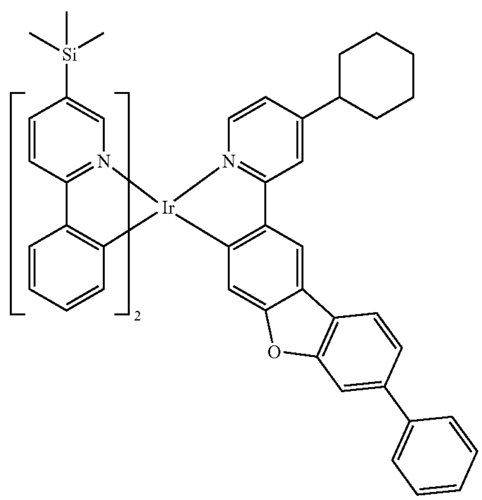
536
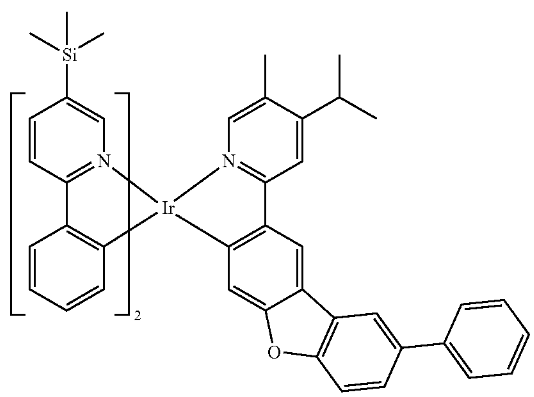
537
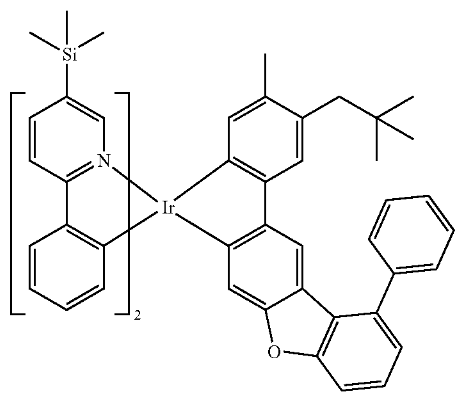

-continued
538
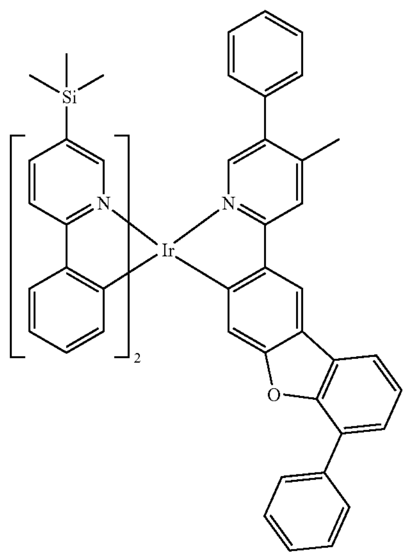
539
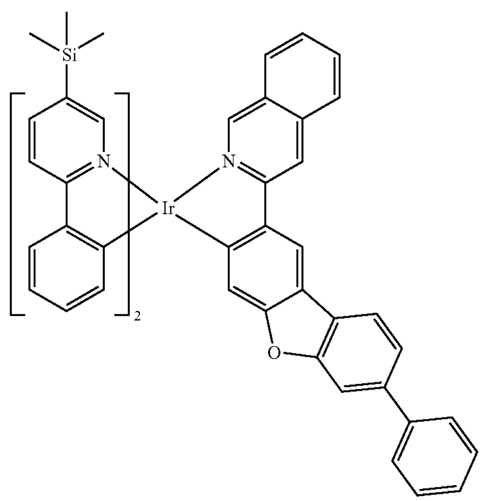
540
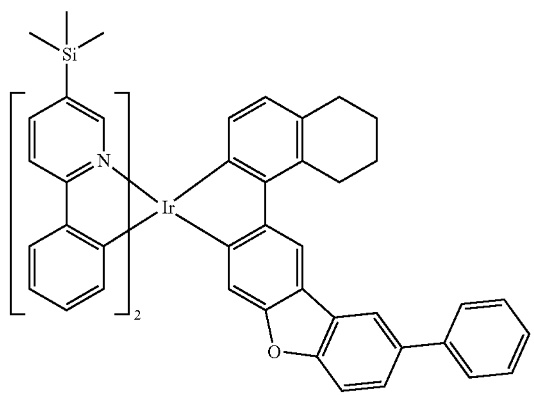

-continued
541
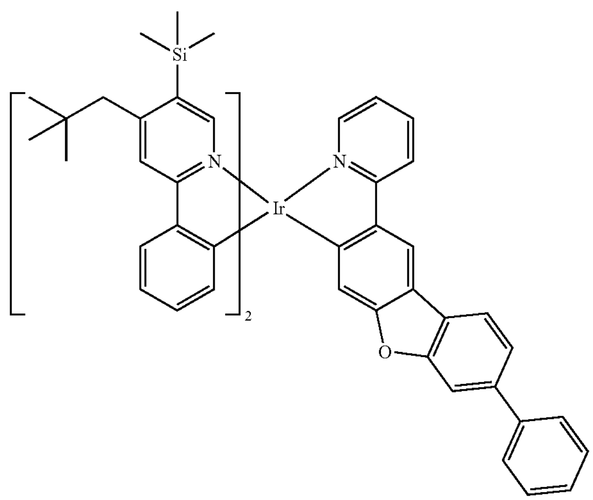
542
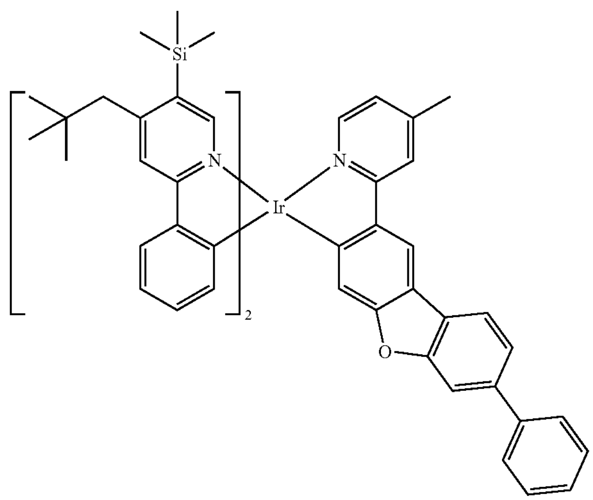
543
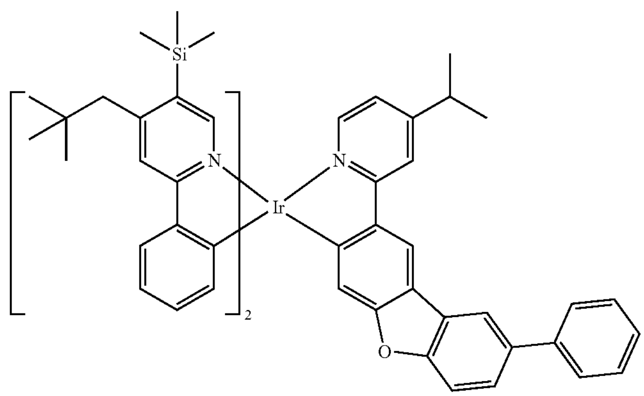

-continued
544
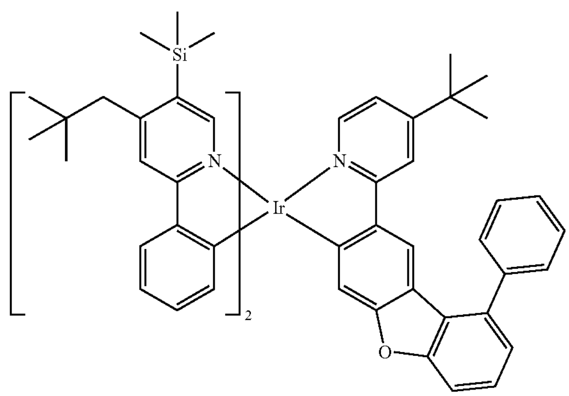
545
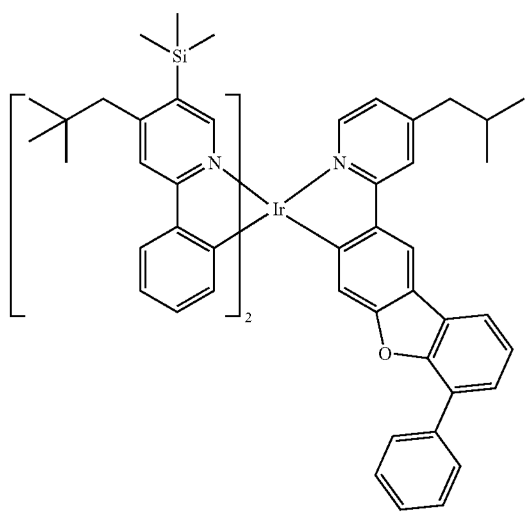
546
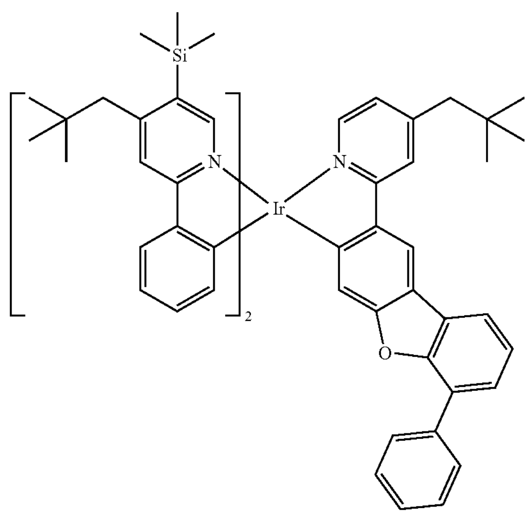

-continued
547
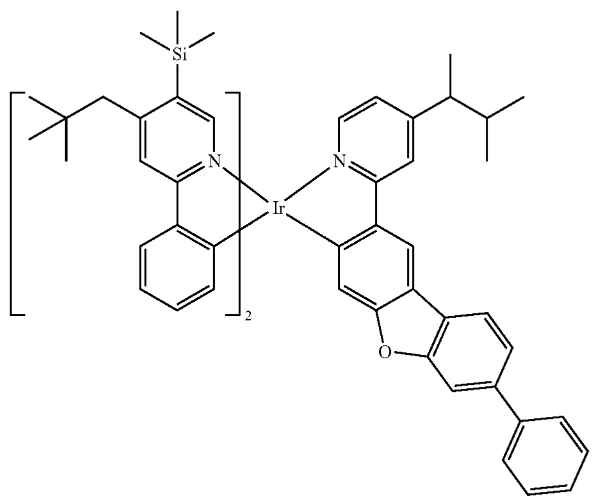
548
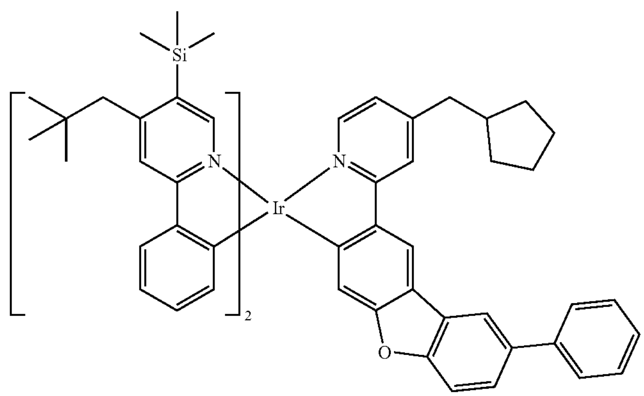
549
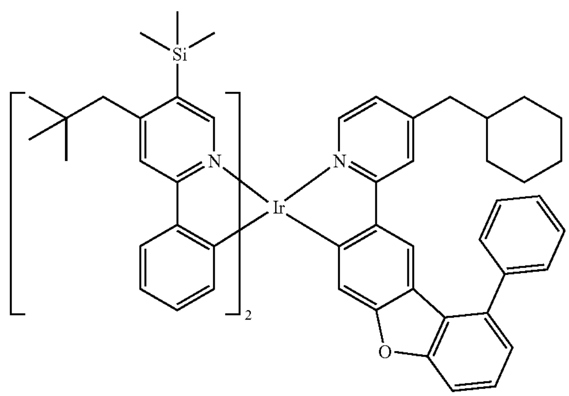

-continued
550
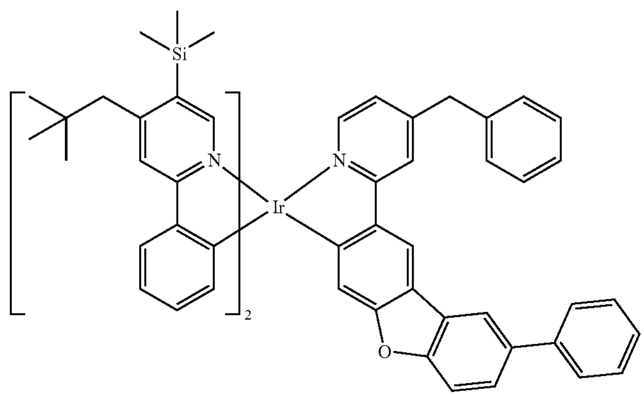
551
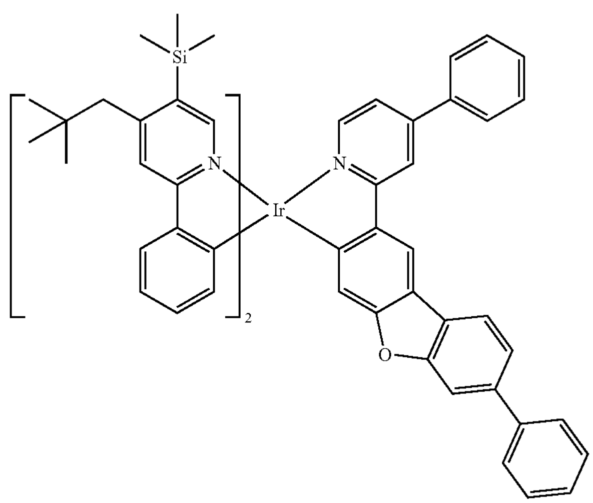
552
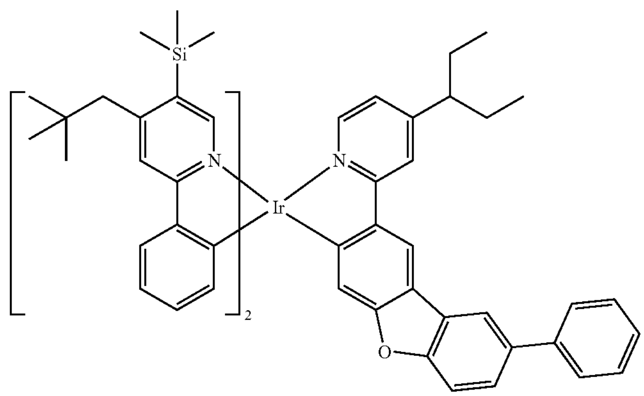

-continued
553
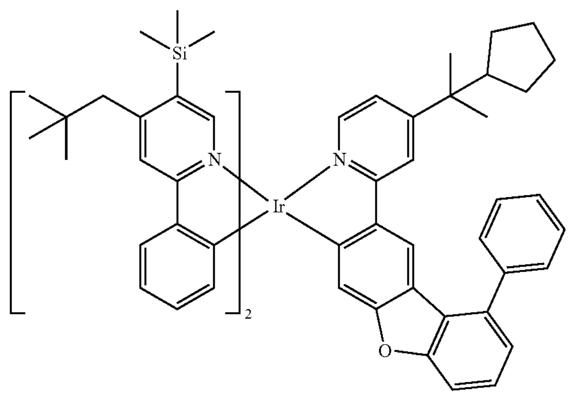
554
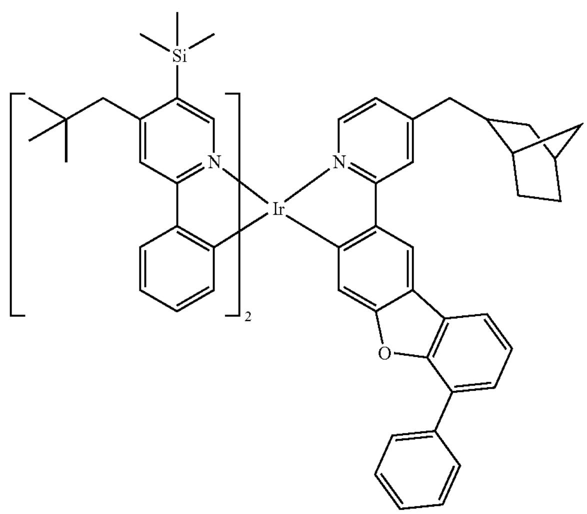
555
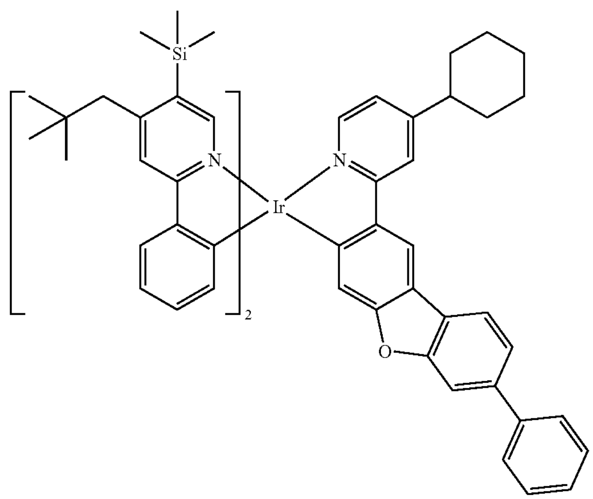

-continued
556
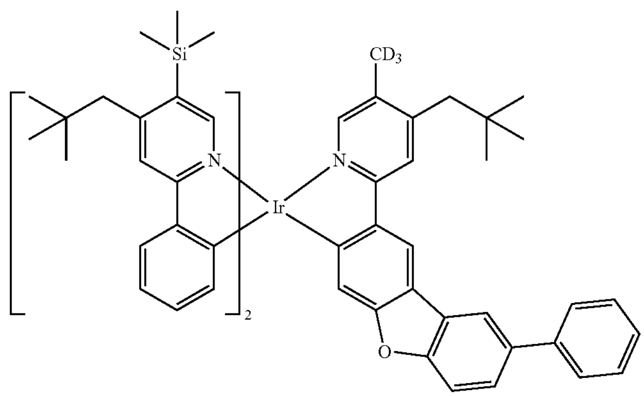
557
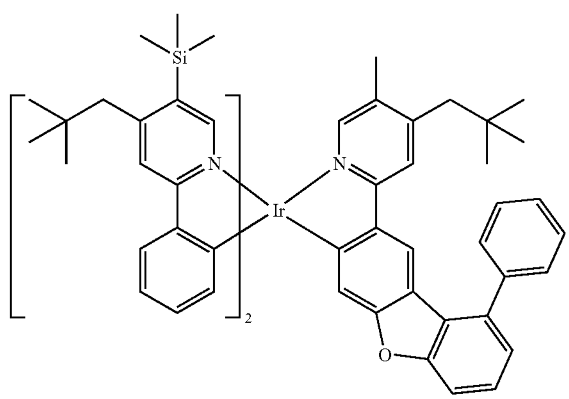
558
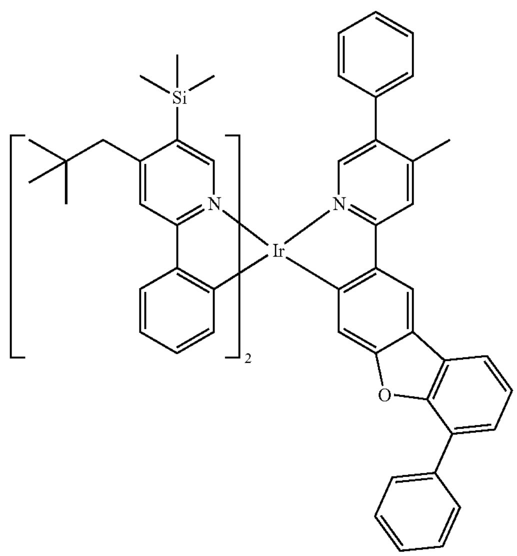

-continued
559
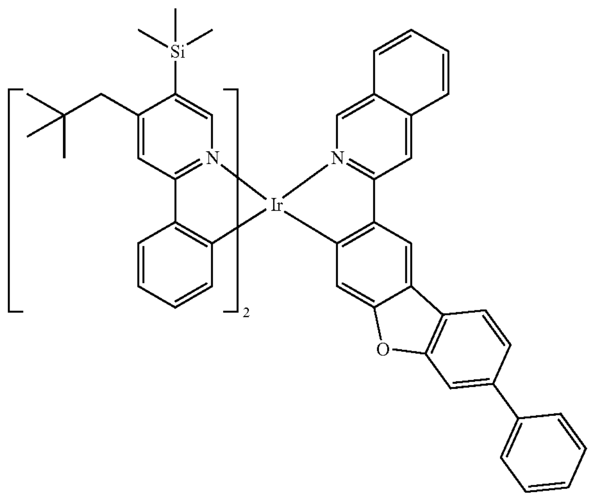
560
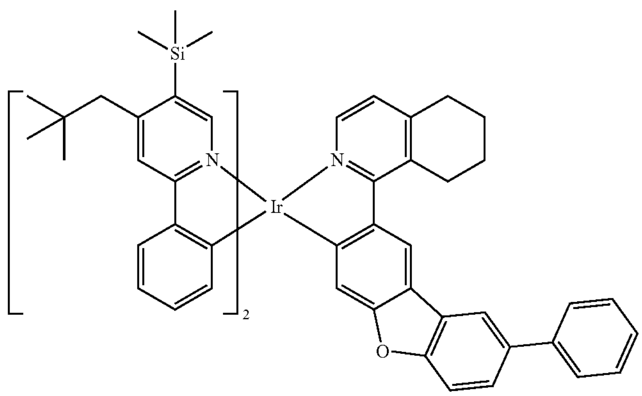
-continued
561
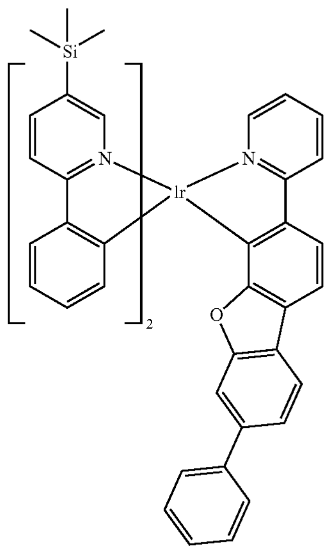
562
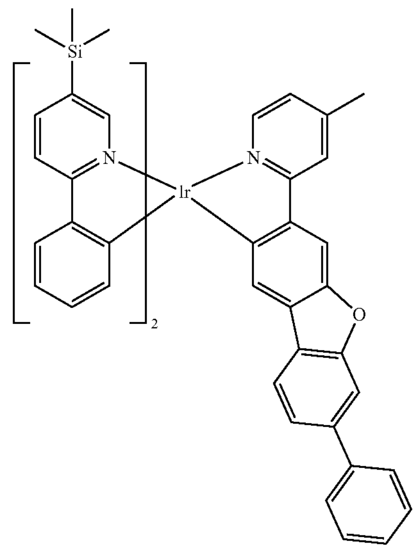

563
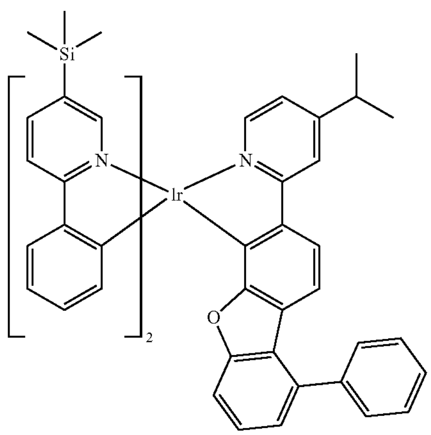
564
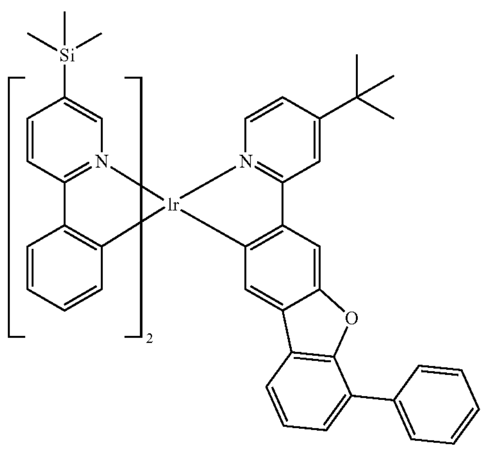
565
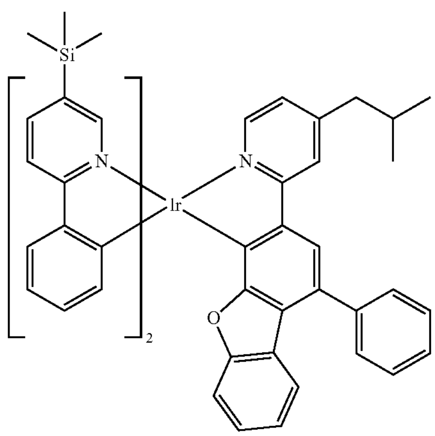
566
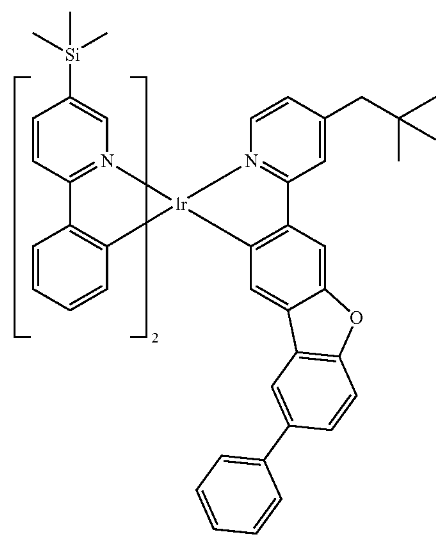
567
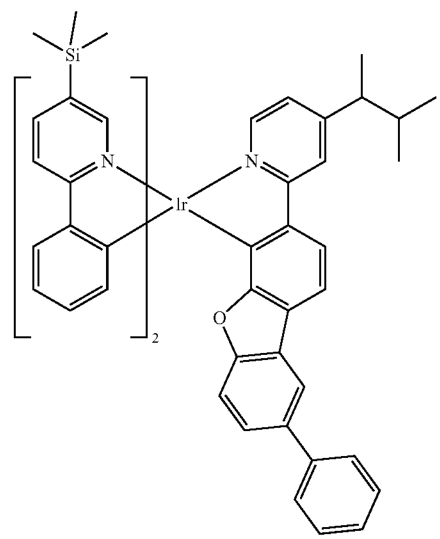
568
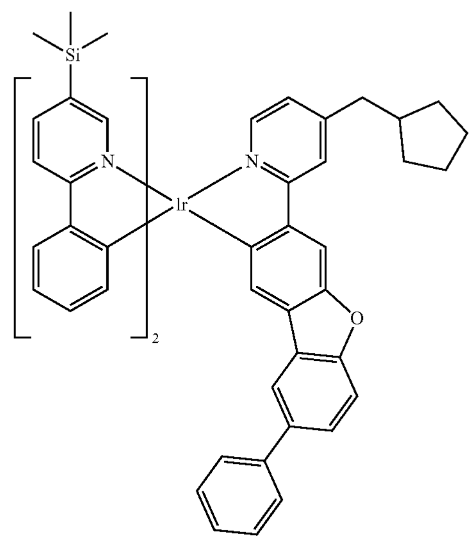

-continued
569
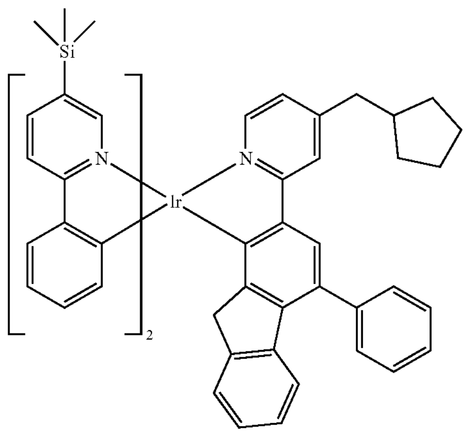
570
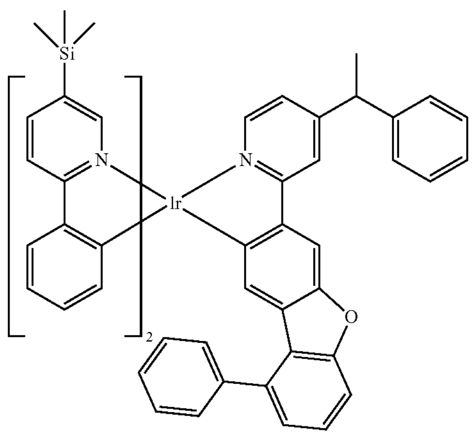
571
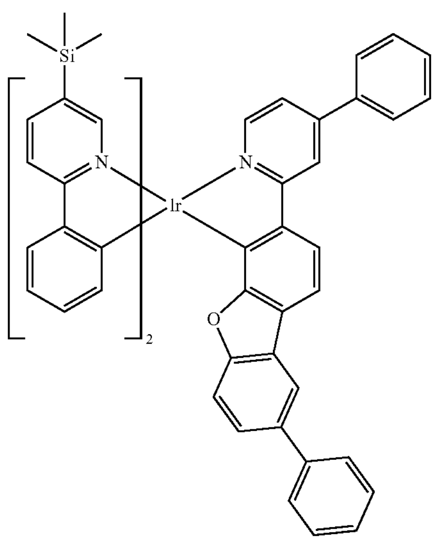
-continued
572
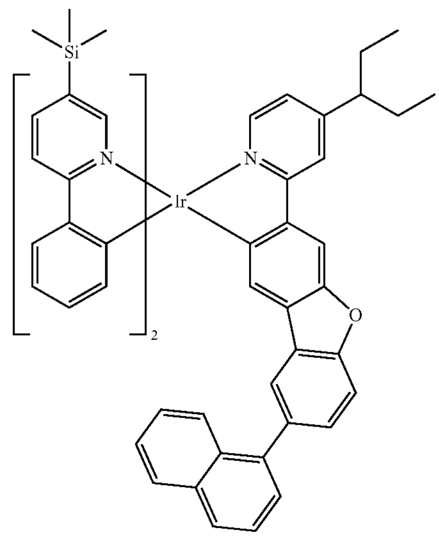
573
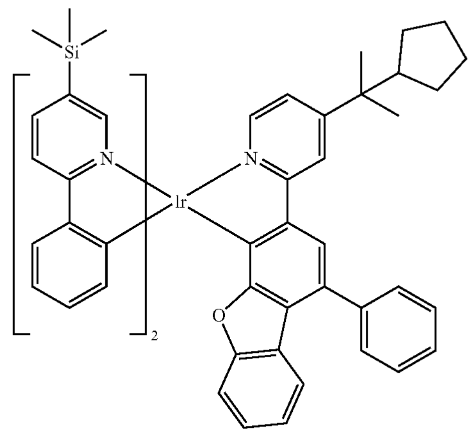
574
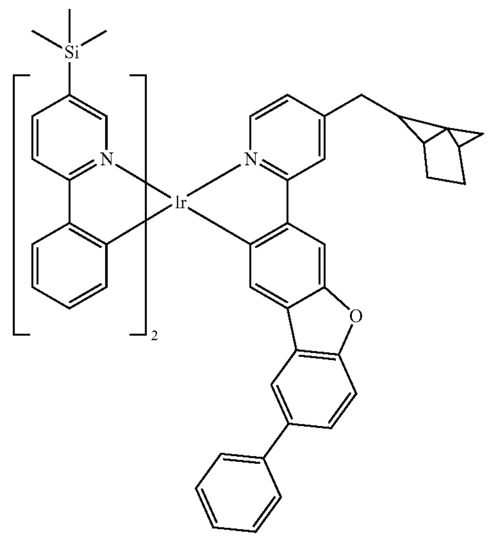

-continued
575
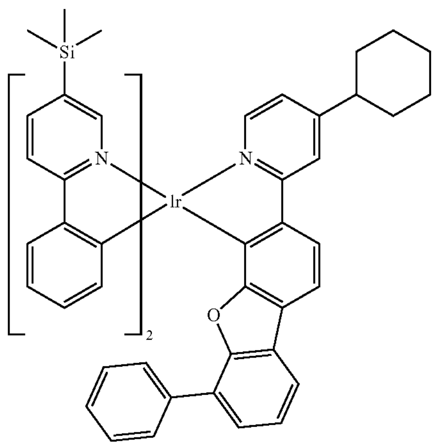
576
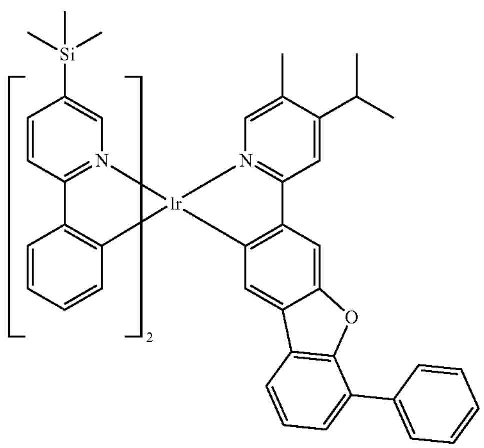
577
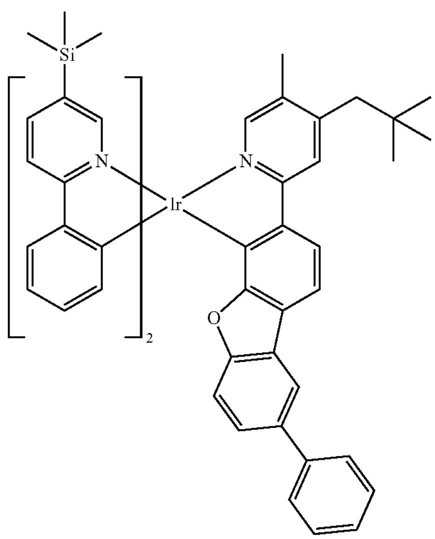
-continued
578
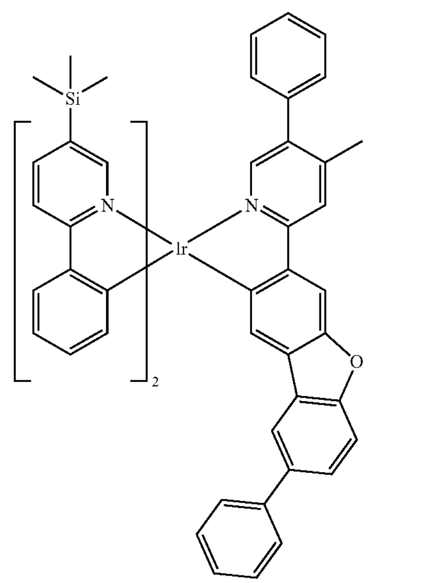
579
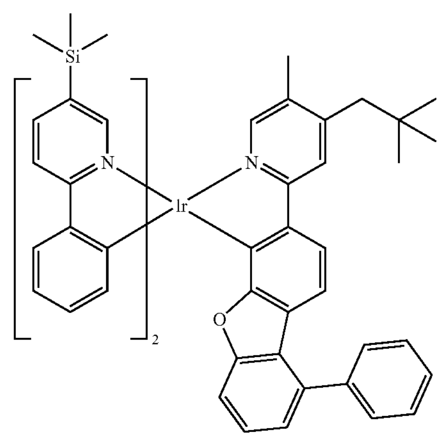
580
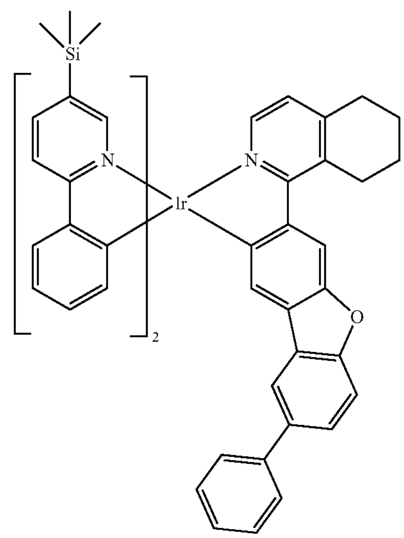

-continued
581
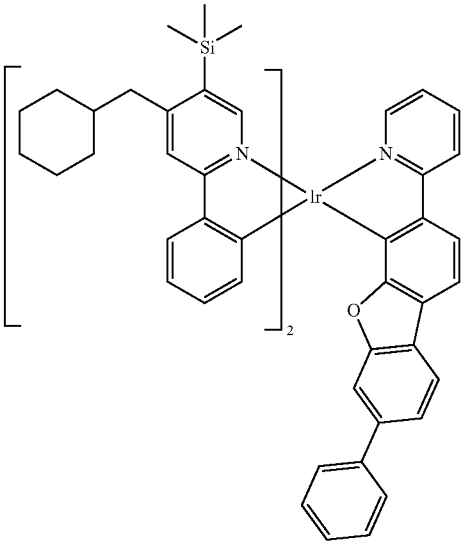
582
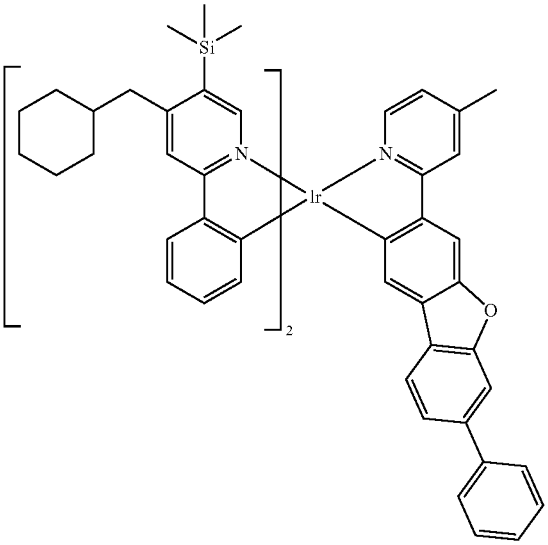
583
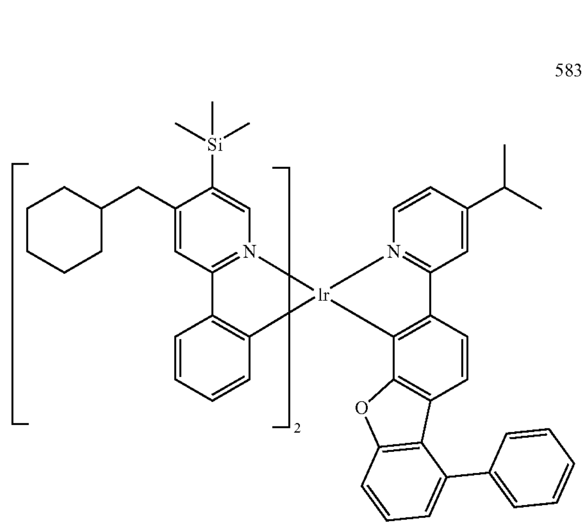
-continued
584
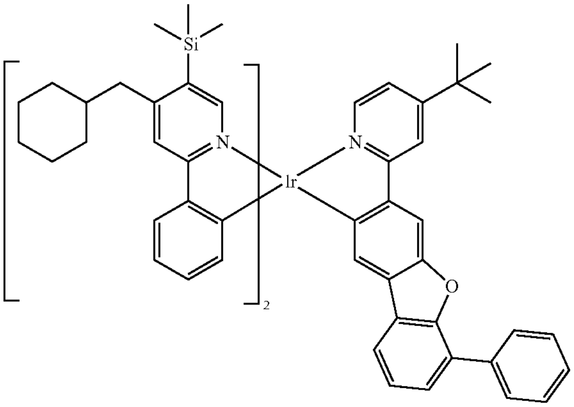
585
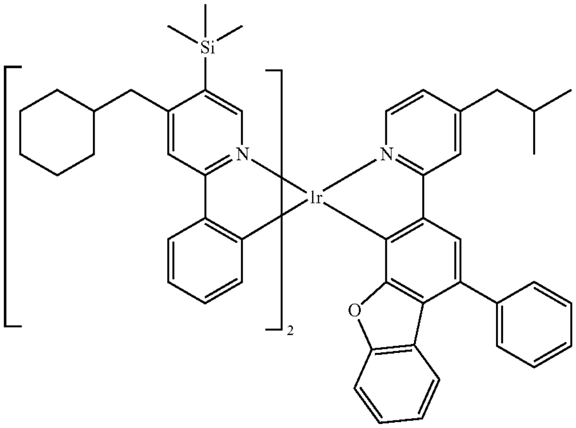
586
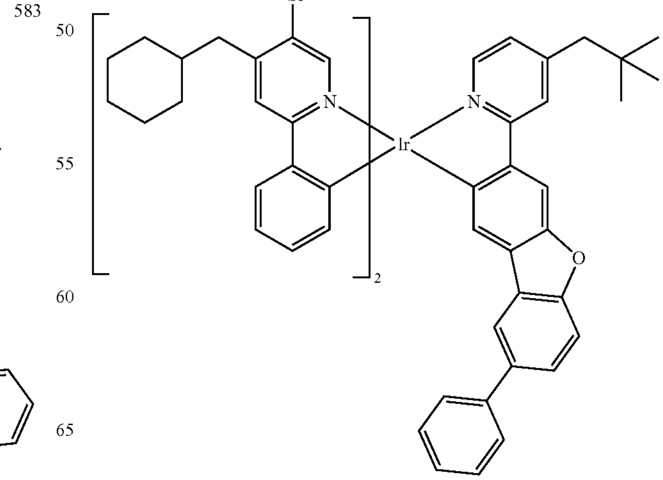

-continued
587
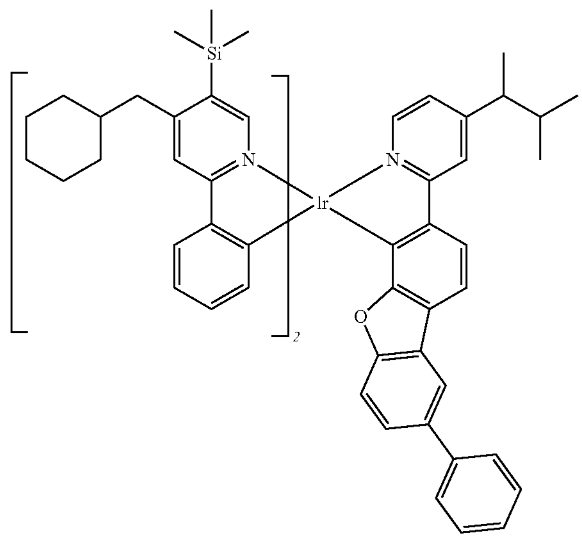
588
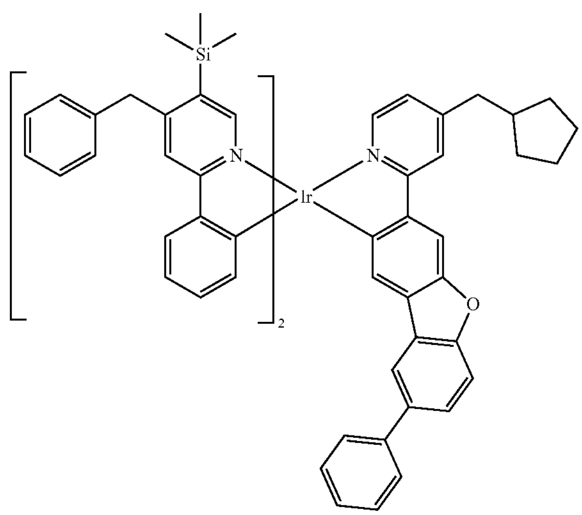
589
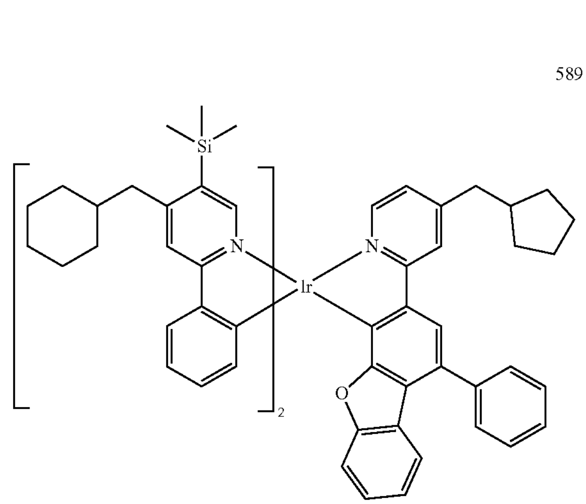
-continued
590
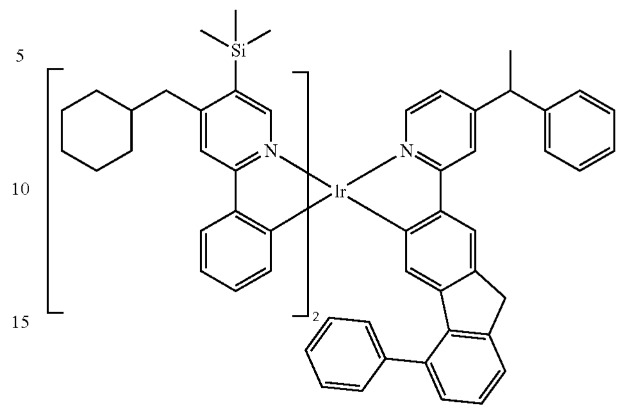
591
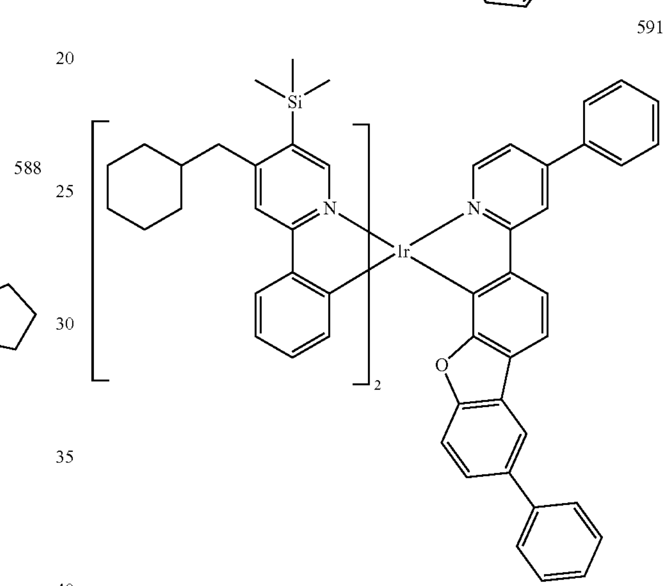
592
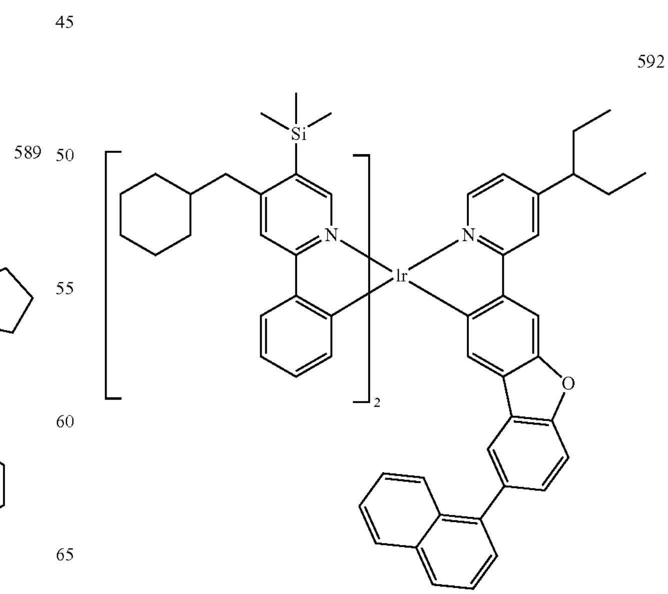

-continued
593
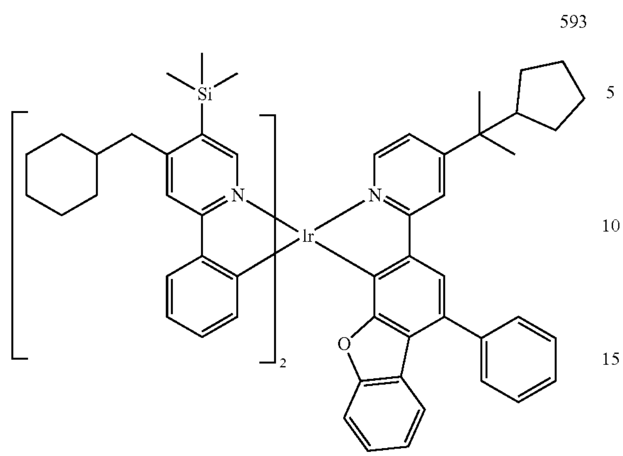
594
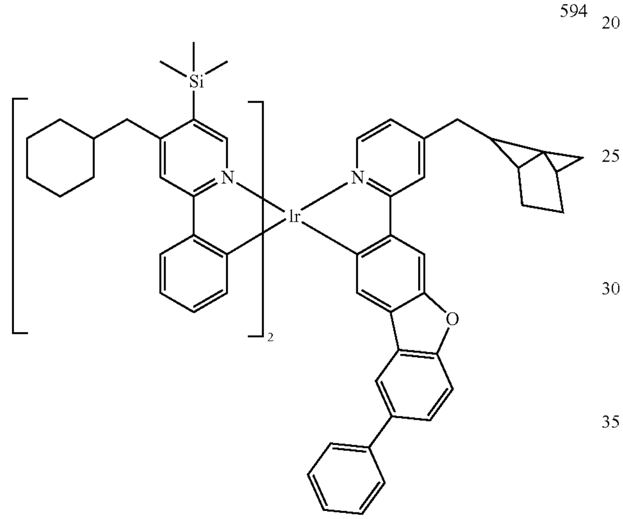
595
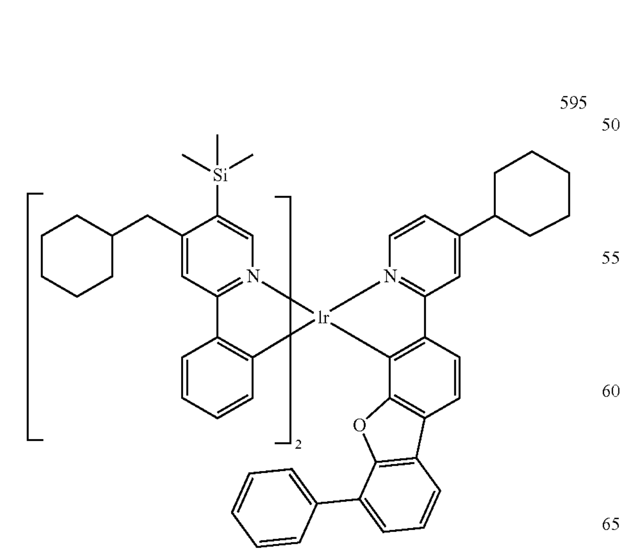
-continued
596
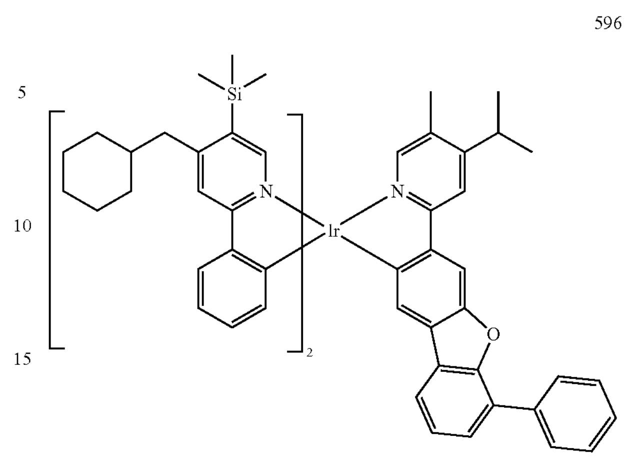
597
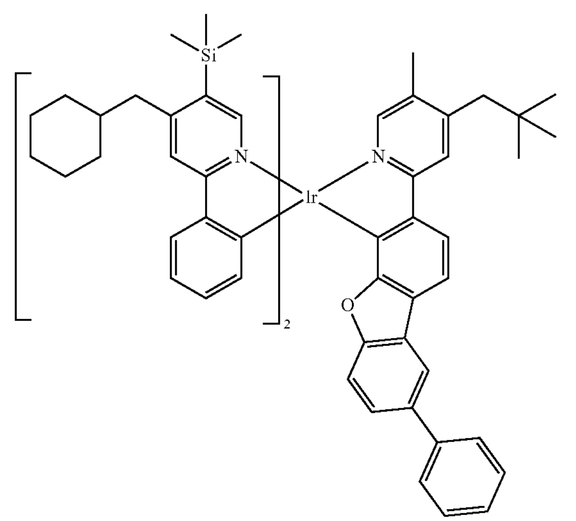
598
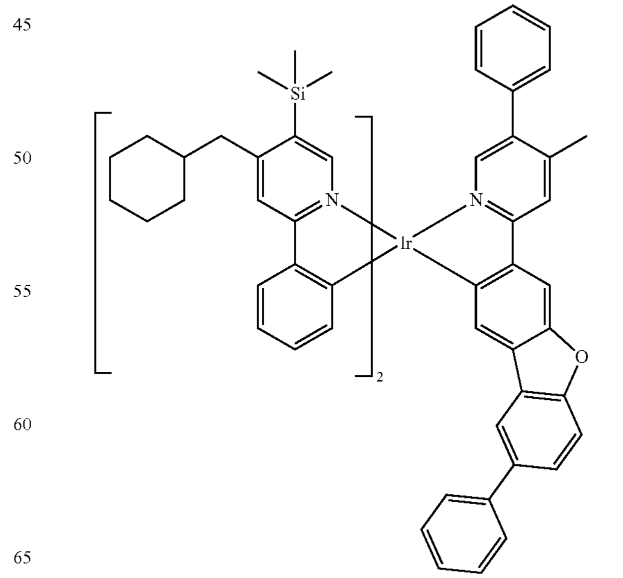

-continued
599
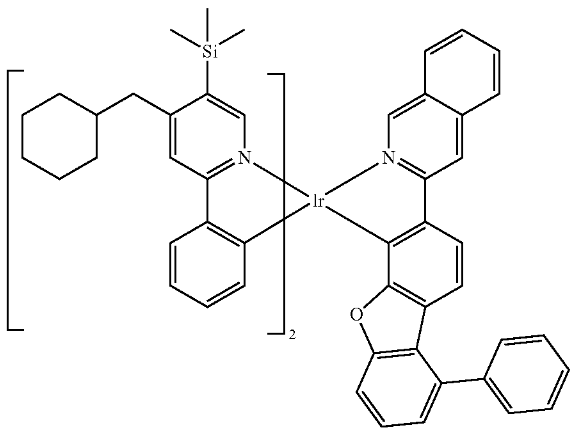
600
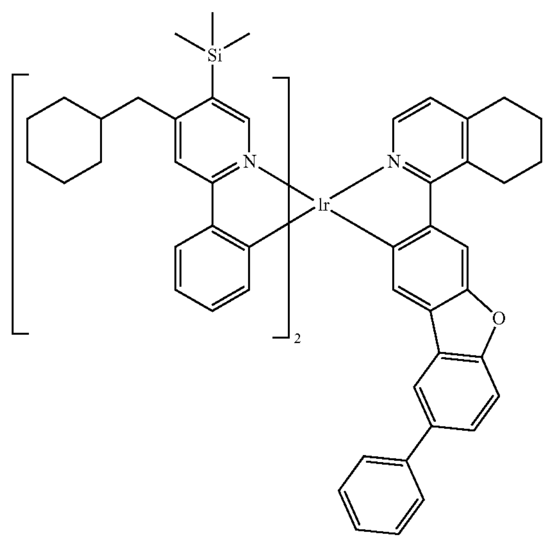
601
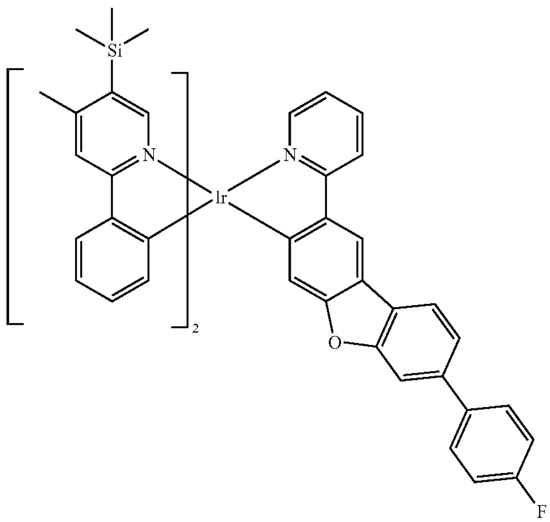
-continued
602
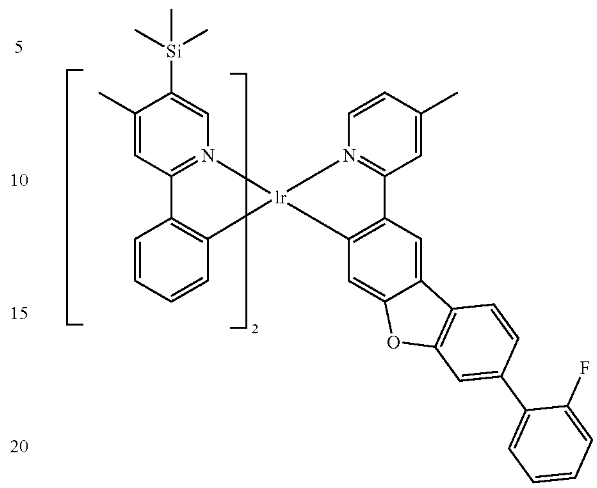
603
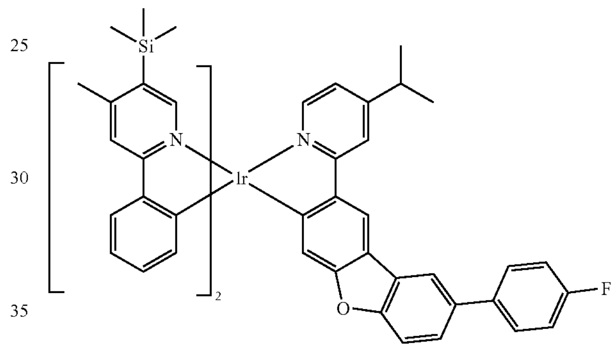
604
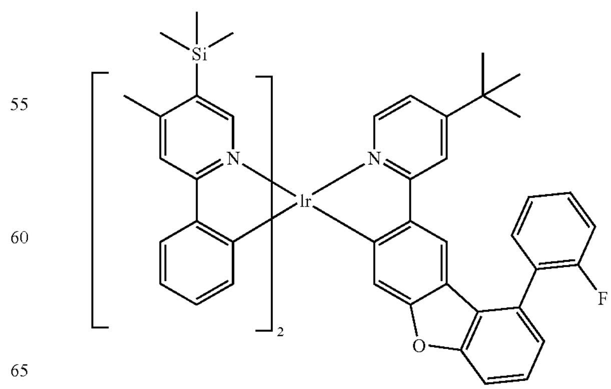

-continued
605
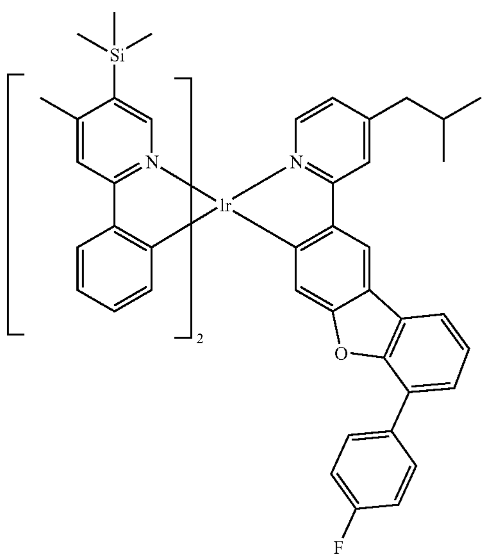
606
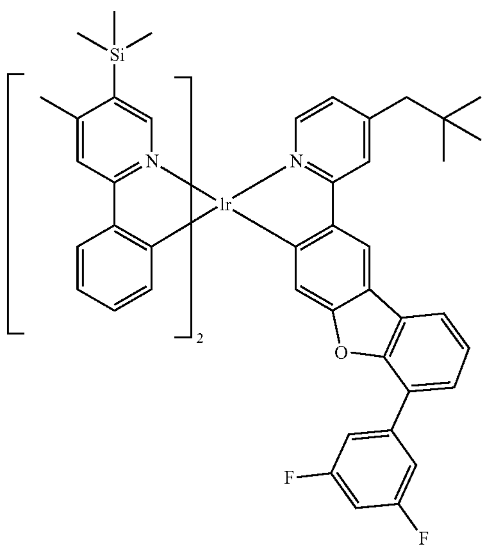
607
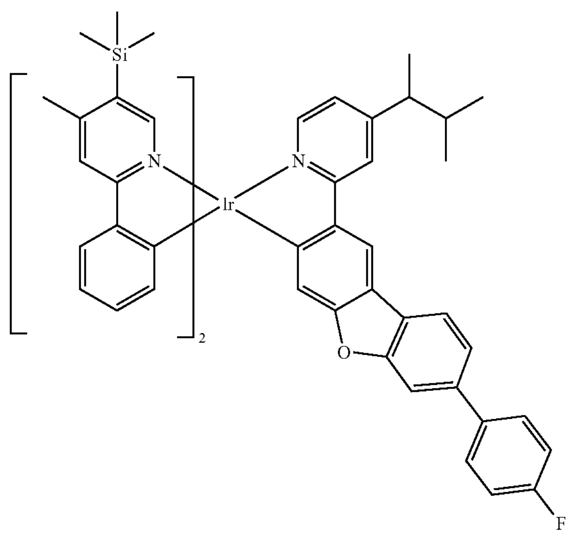
-continued
608
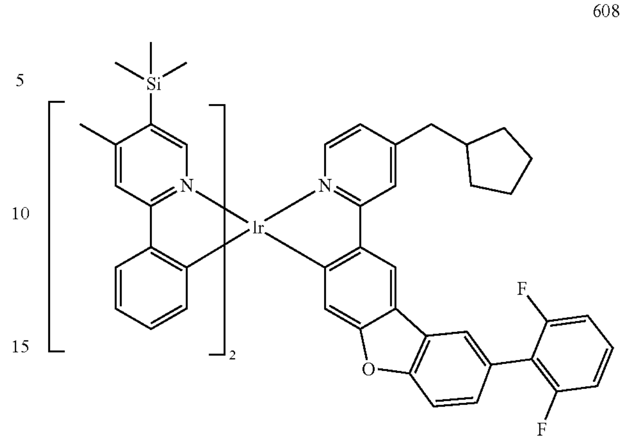
609
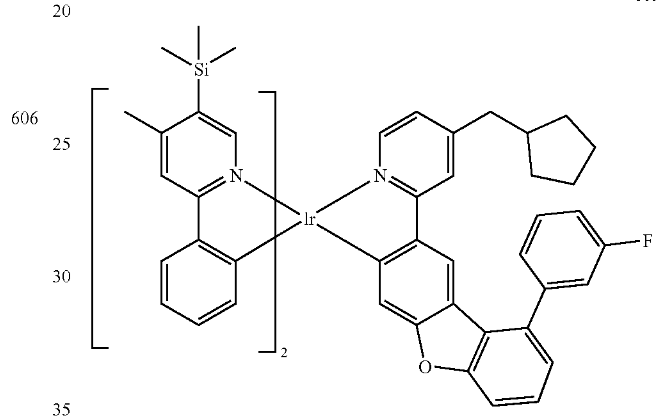
610
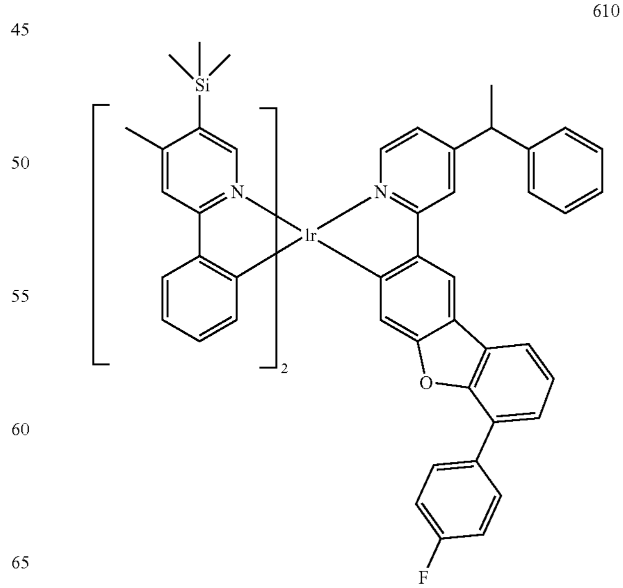

-continued
611
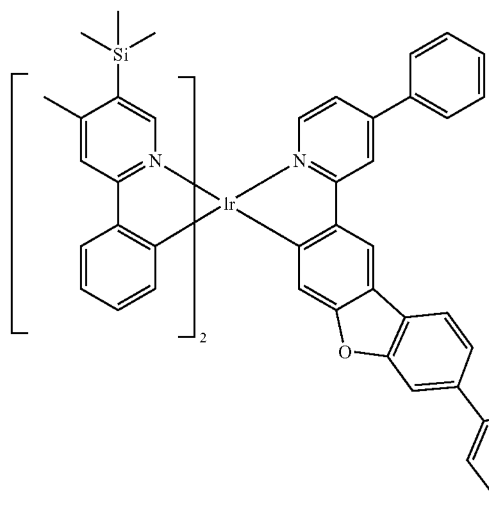
612
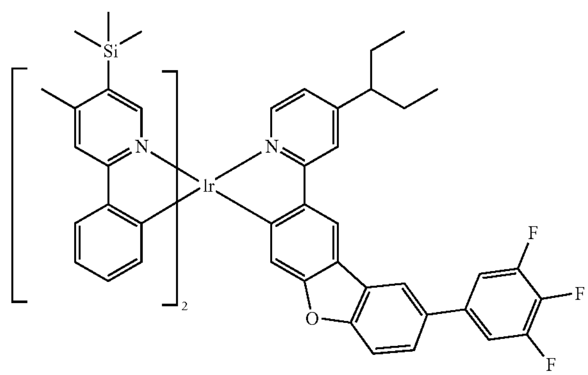
613
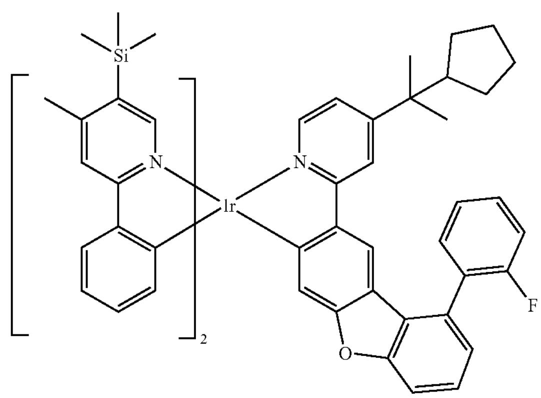
-continued
614
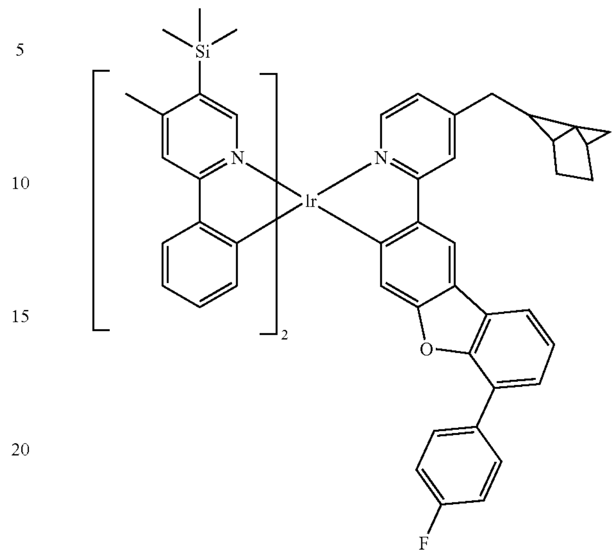
615
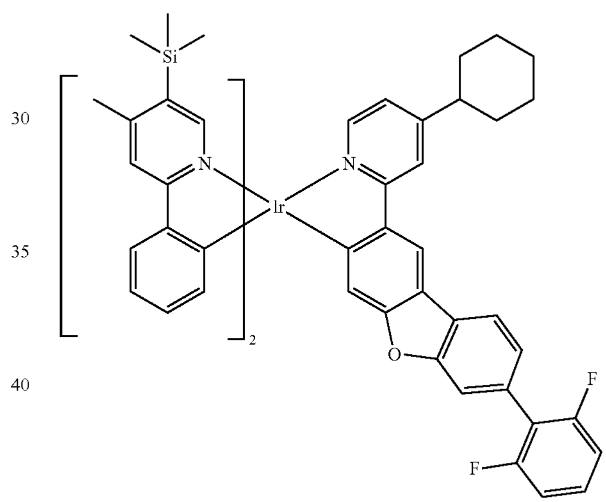
616
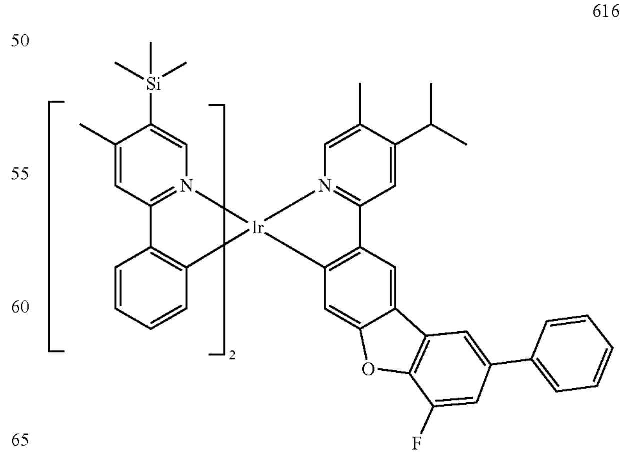

617
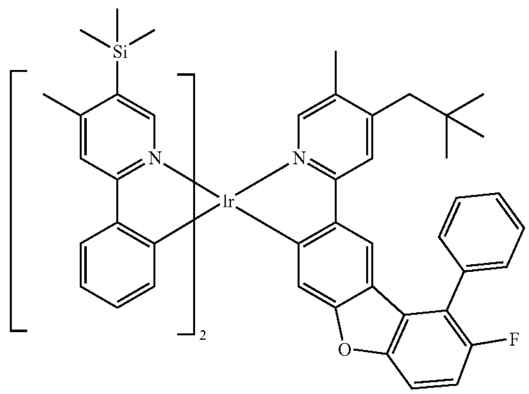
618
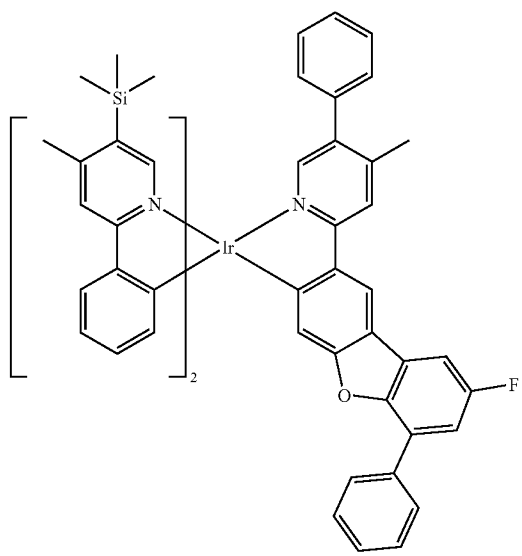
619
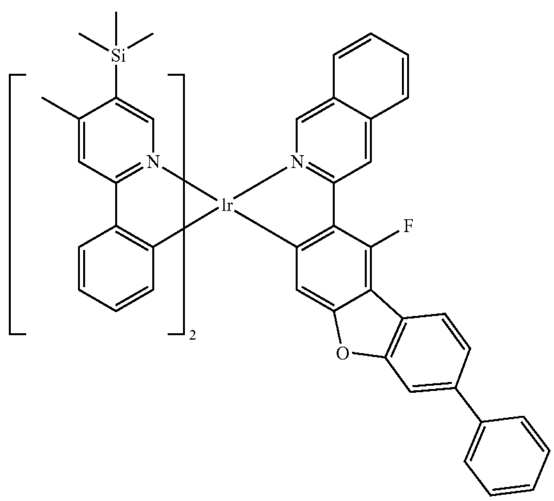
620
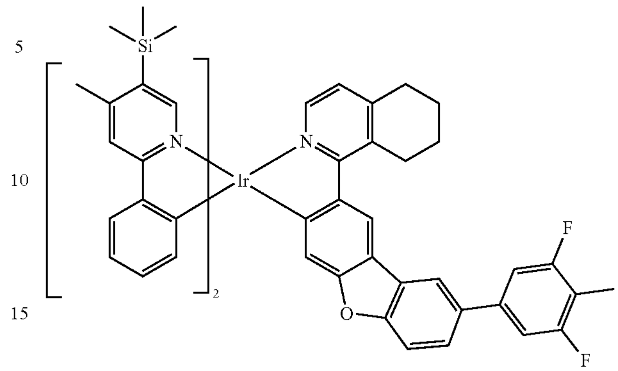
621
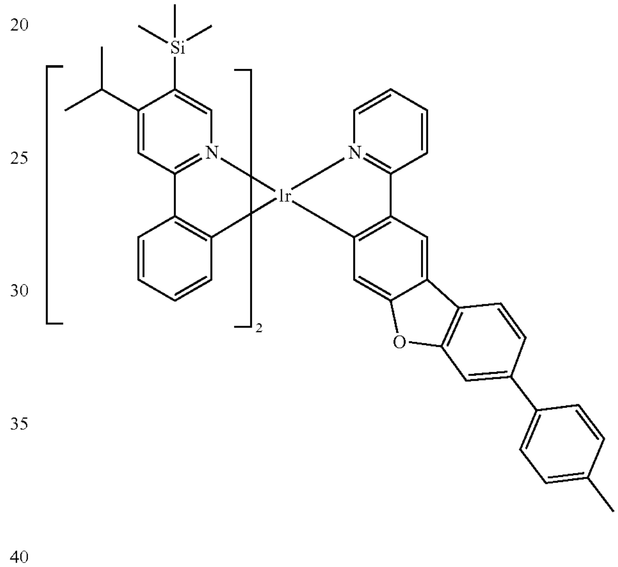
622
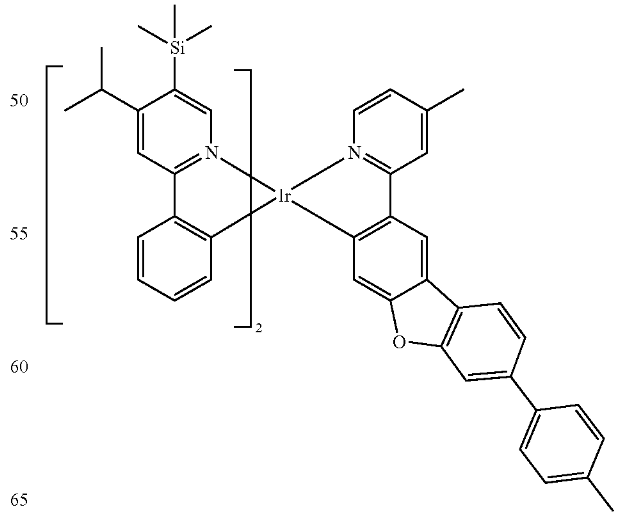

-continued
623
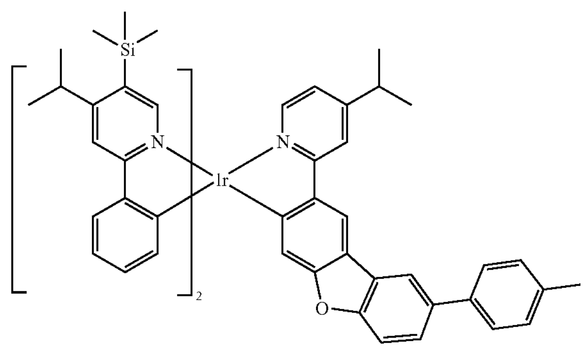
624
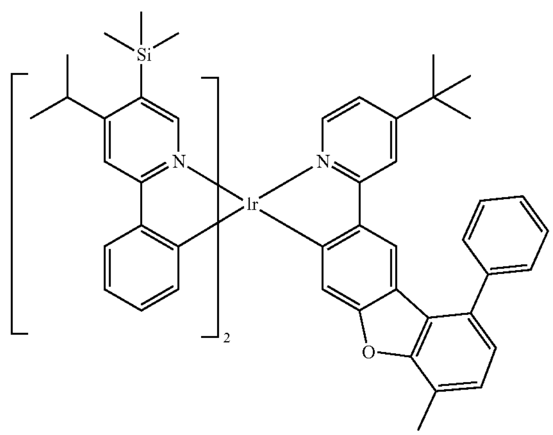
625
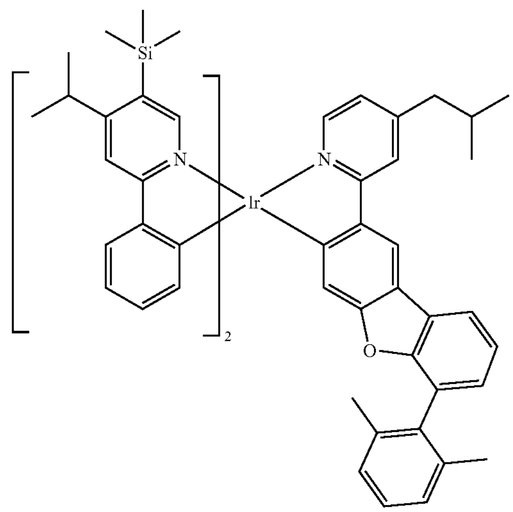
-continued
626
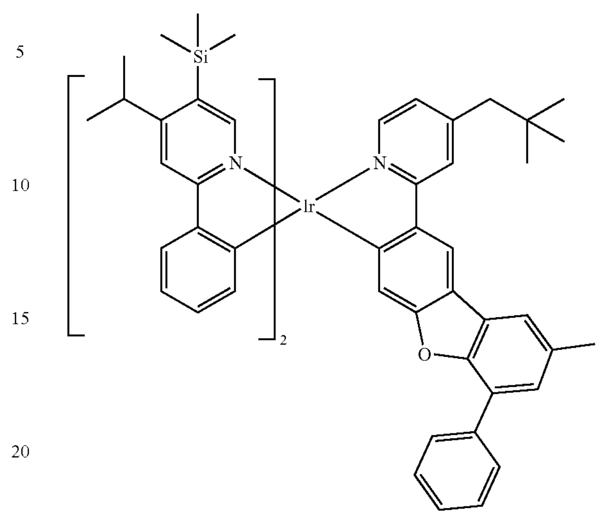
627
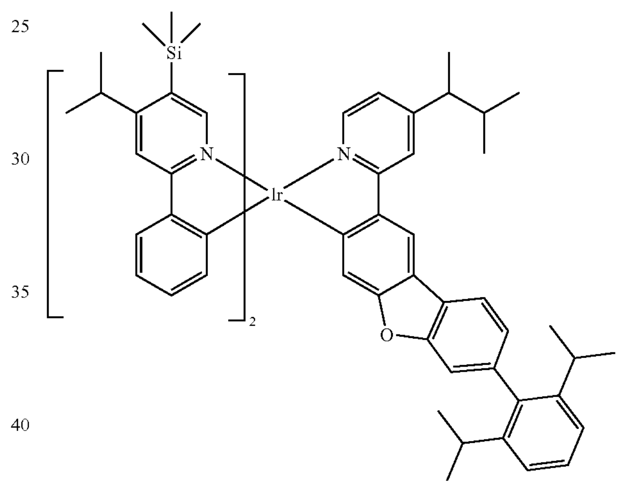
628
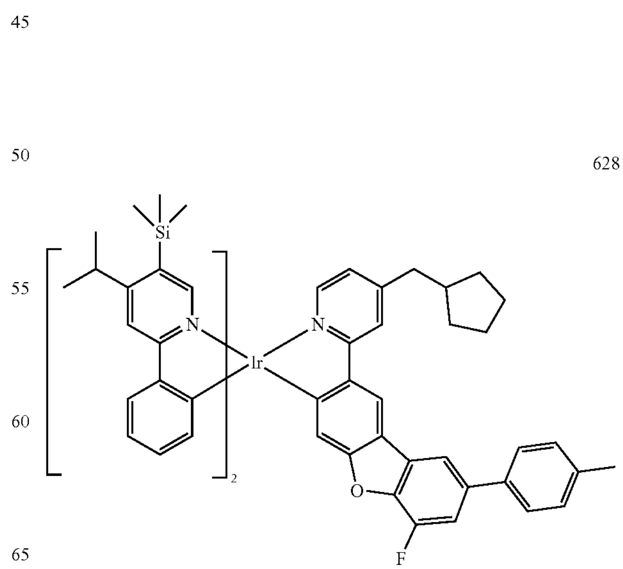

-continued
629
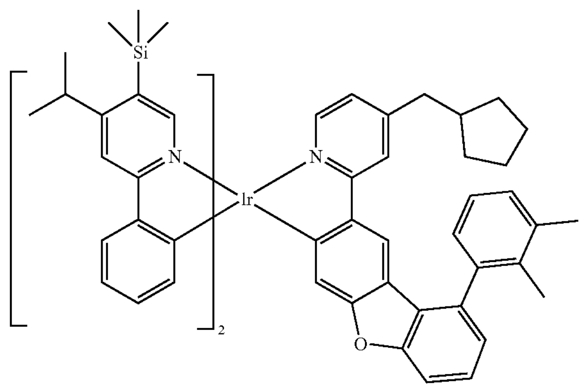
630
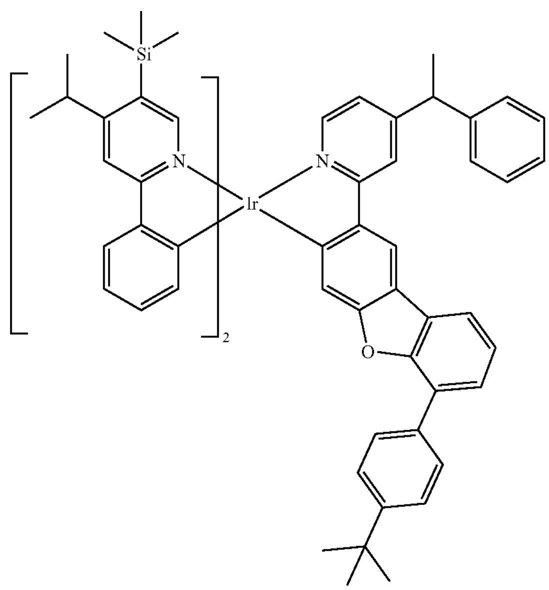
631
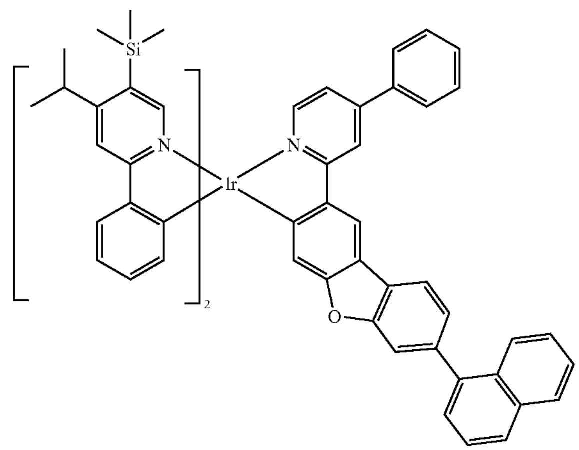
-continued
632
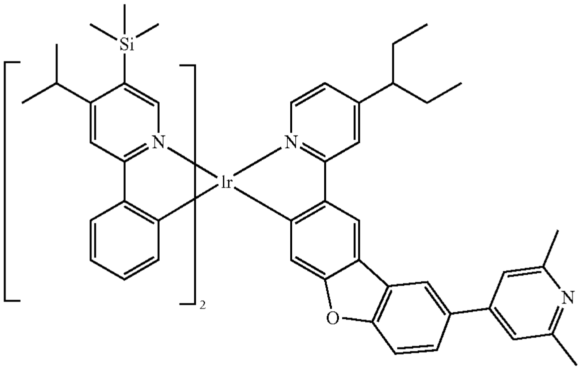
633
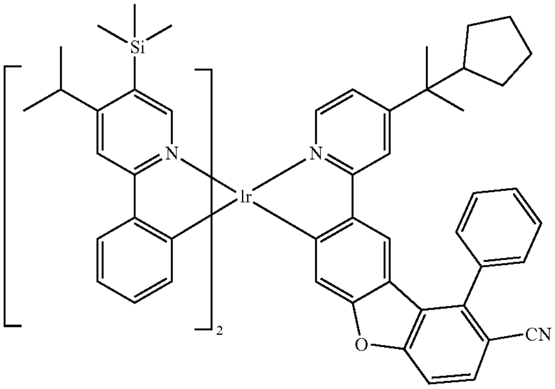
634
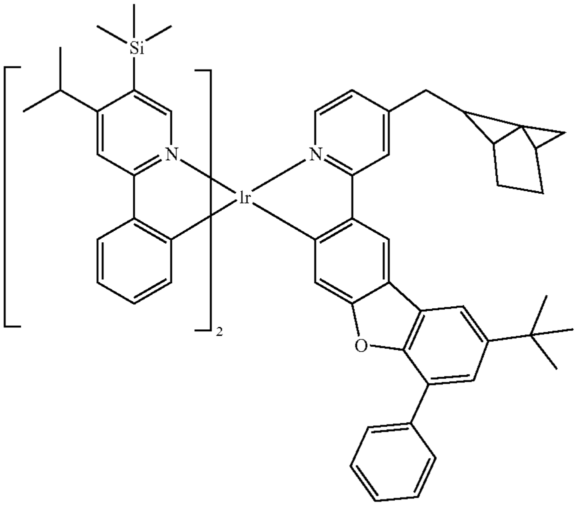

-continued
635
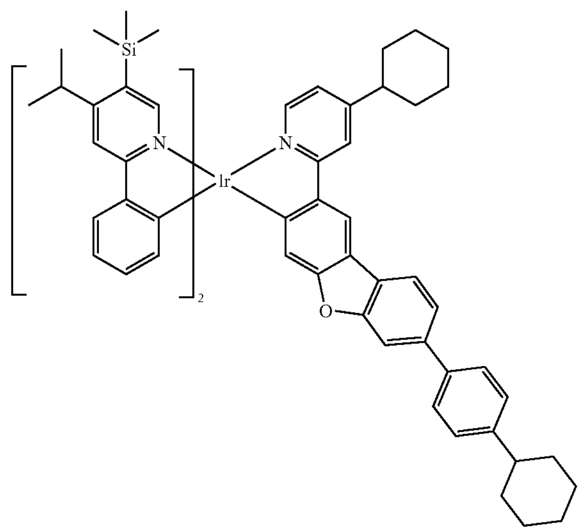
636
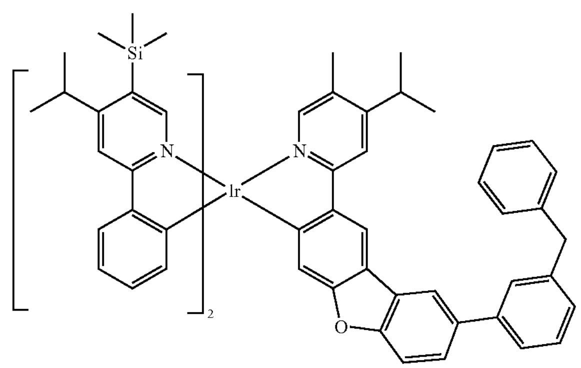
637
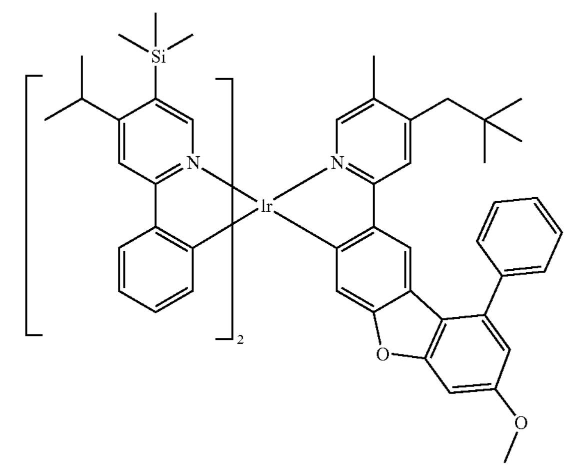
-continued
638
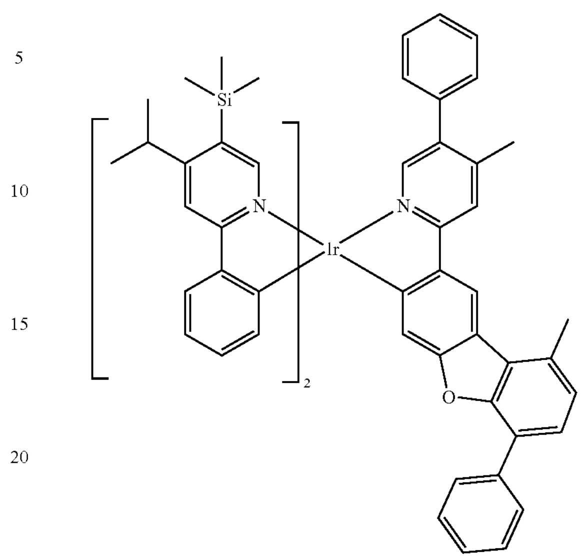
639
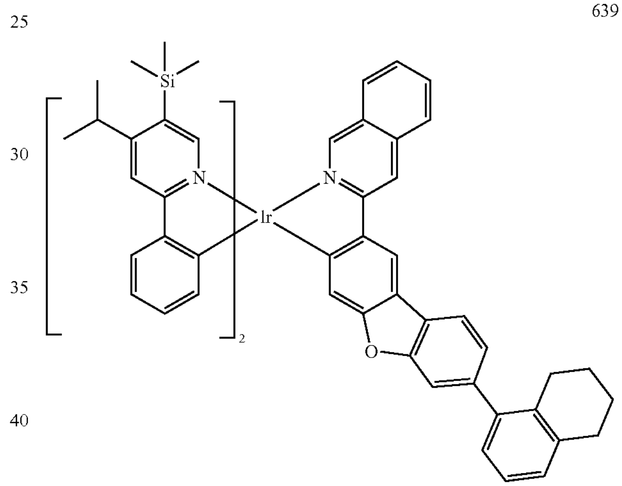
640
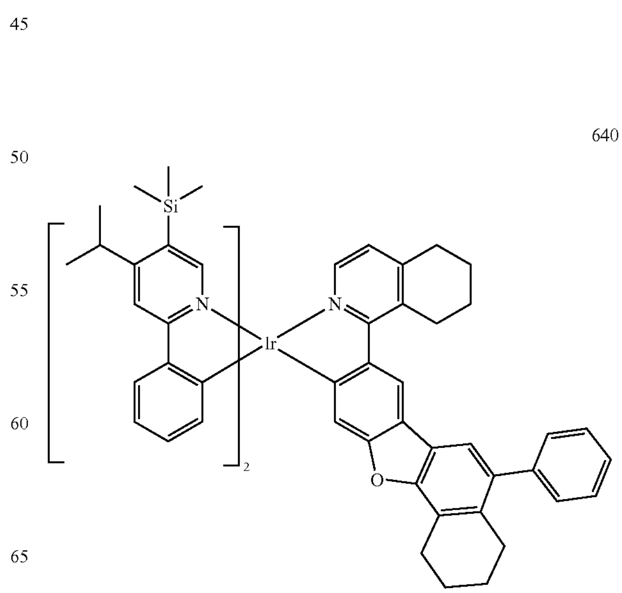

-continued
641
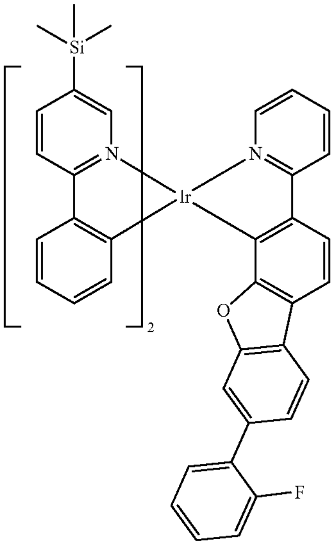
642
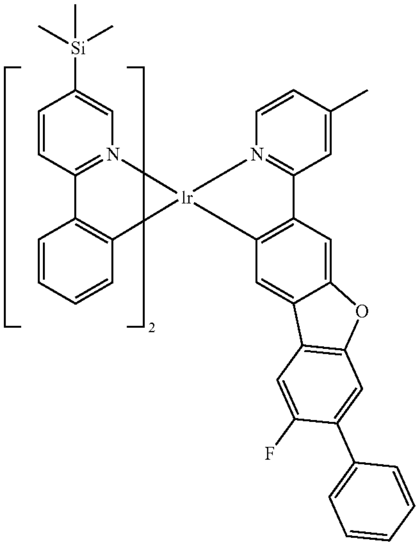
643
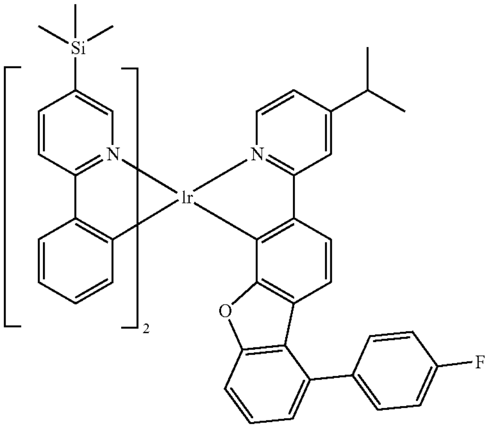
-continued
644
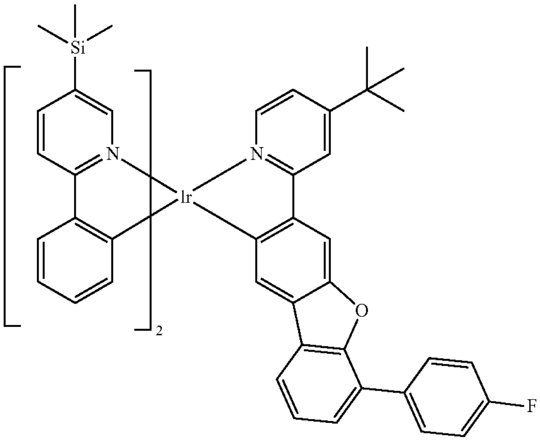
645
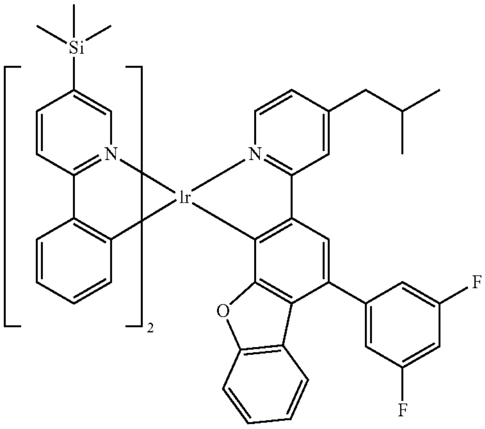
646
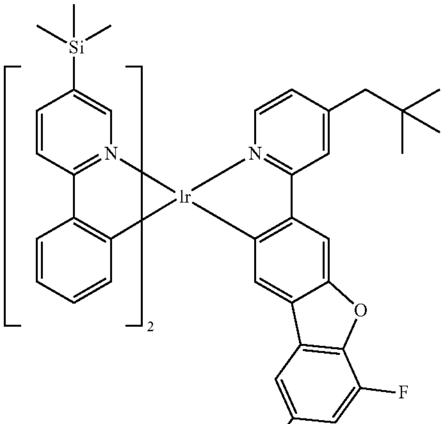

-continued
647
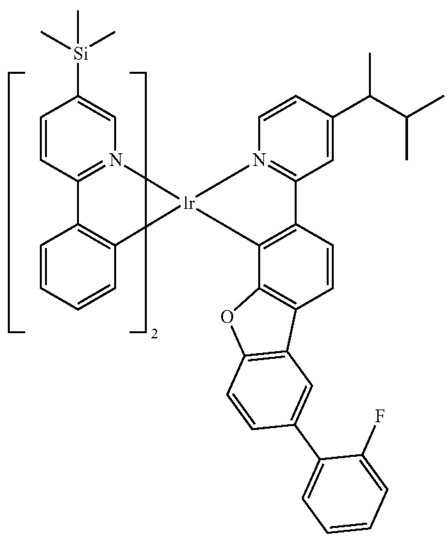
648
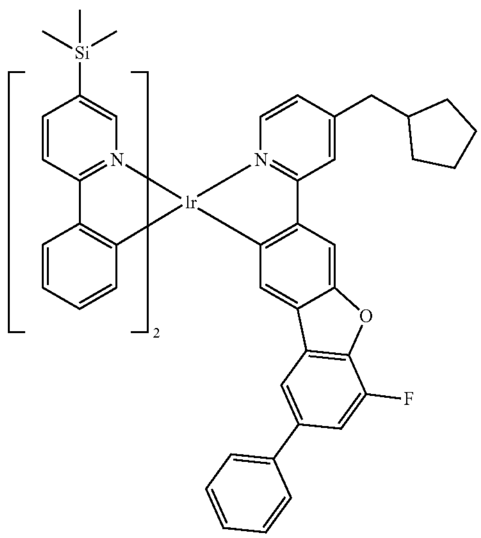
649
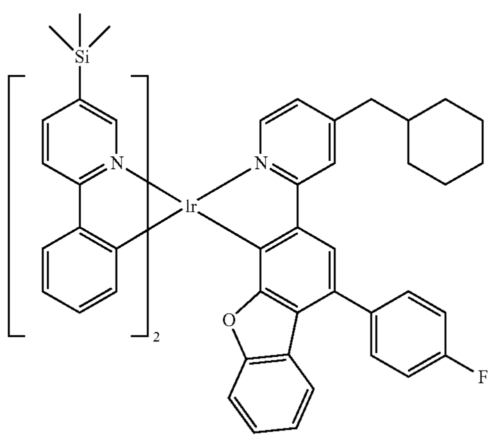
-continued
650
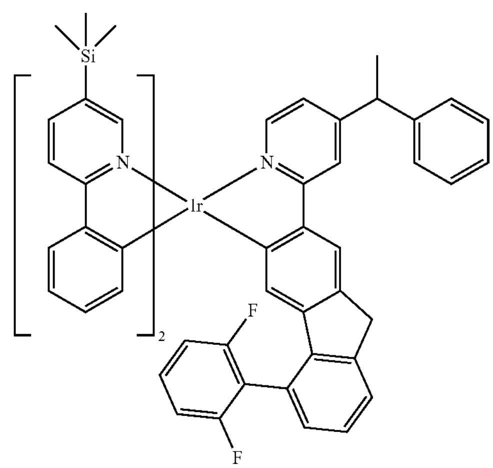
651
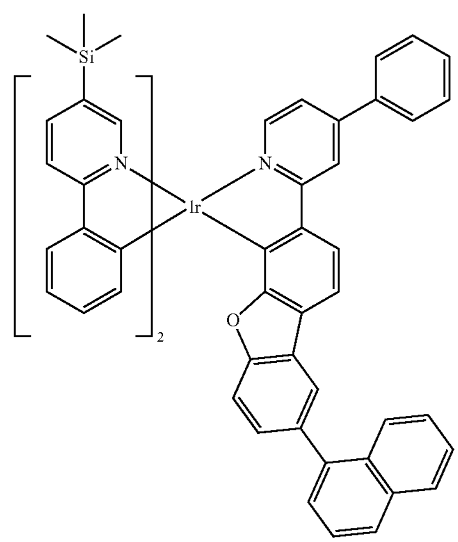
652
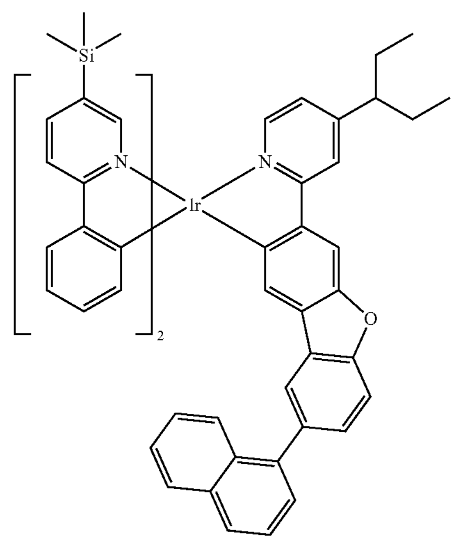

653
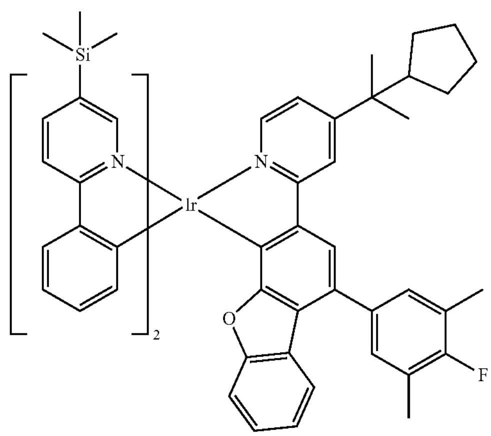
654
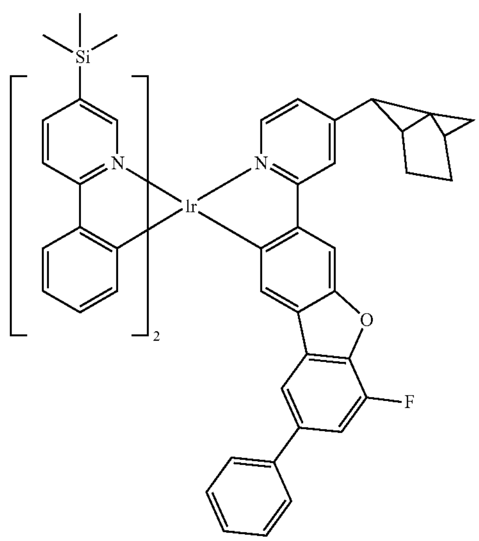
655
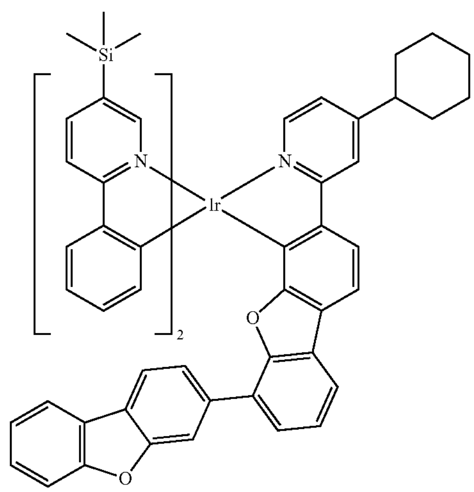
656
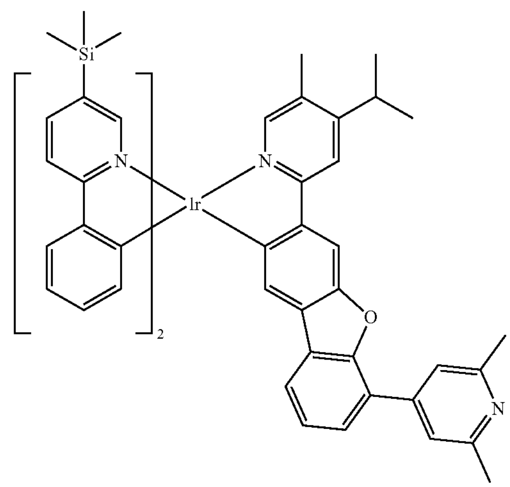
657
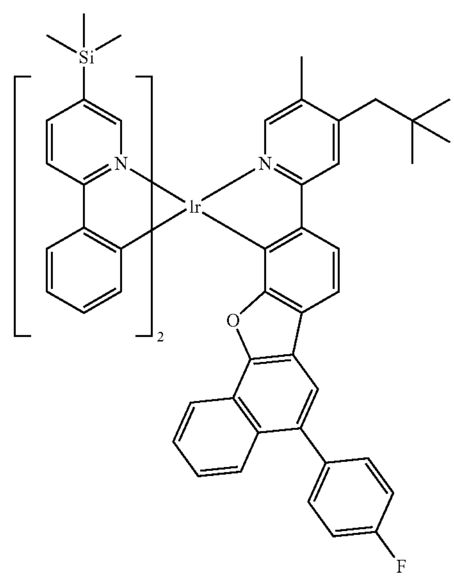
658
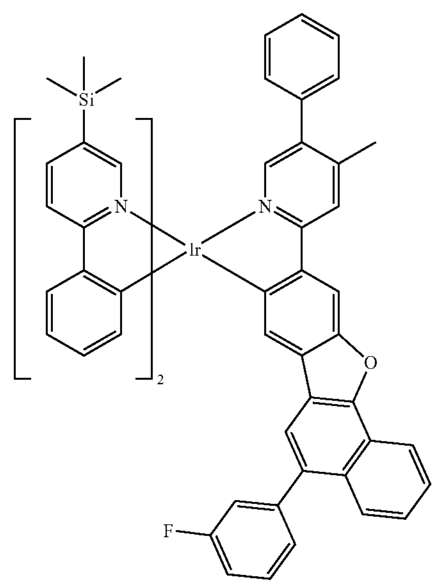

-continued
659
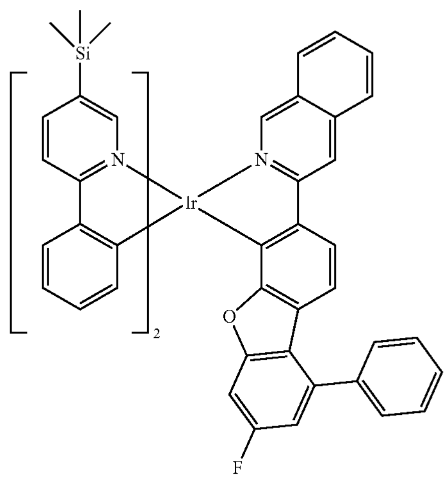
660
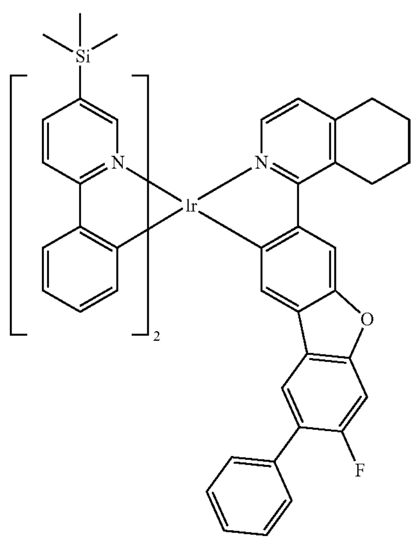
661
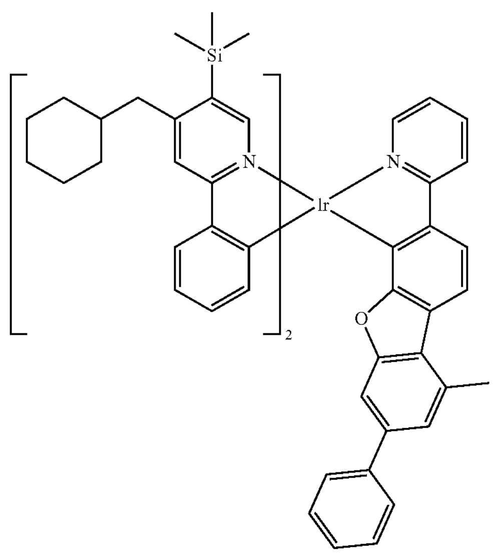
-continued
662
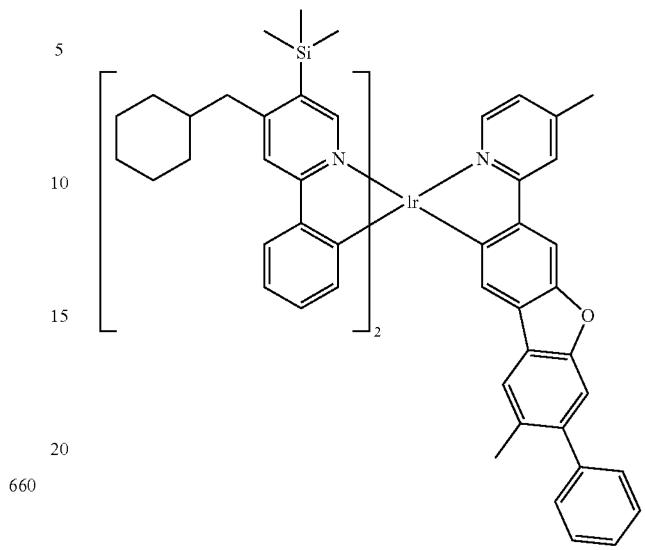
663
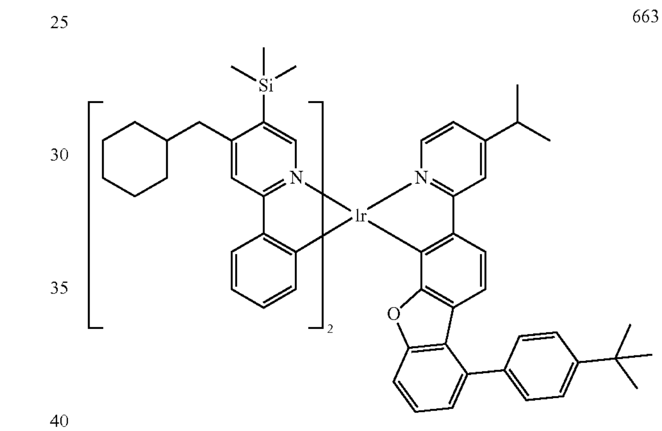
664
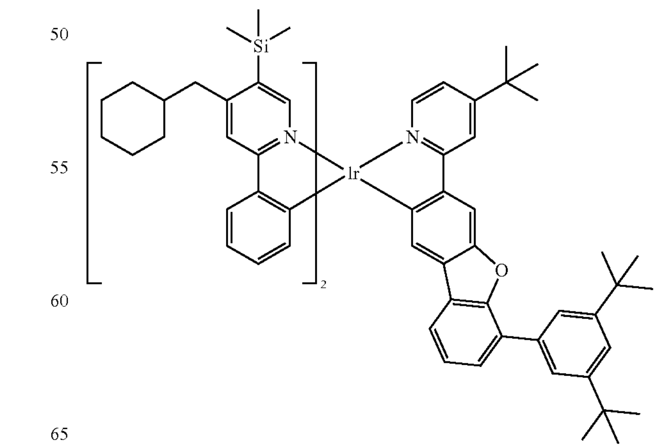

-continued
665
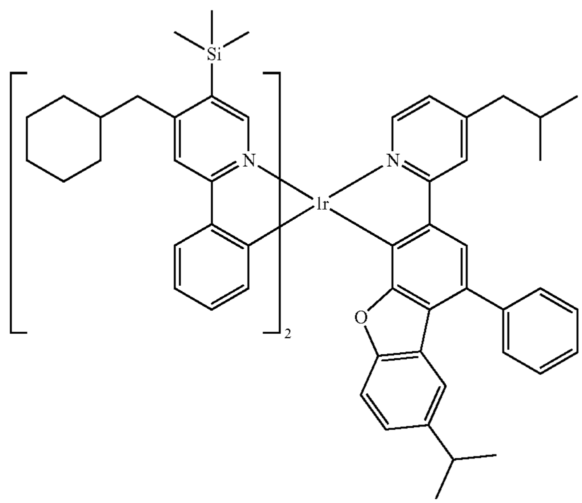
666
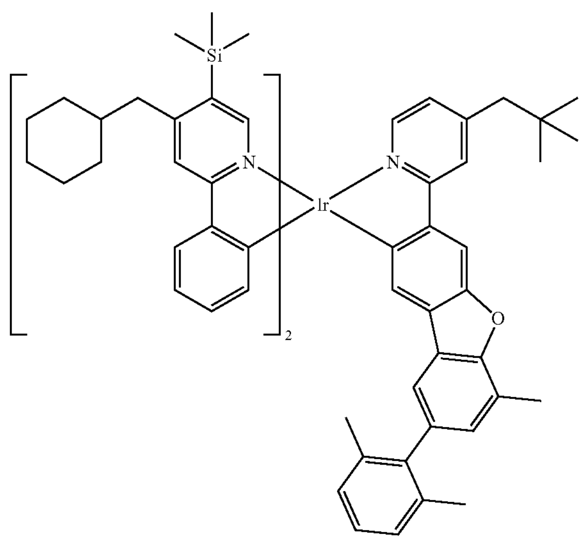
667
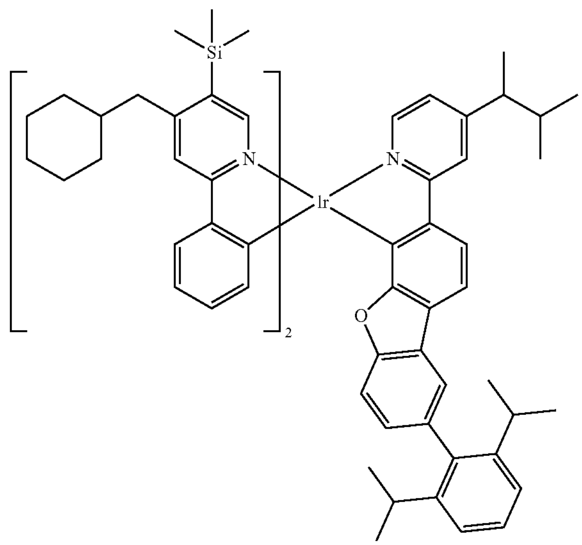
-continued
668
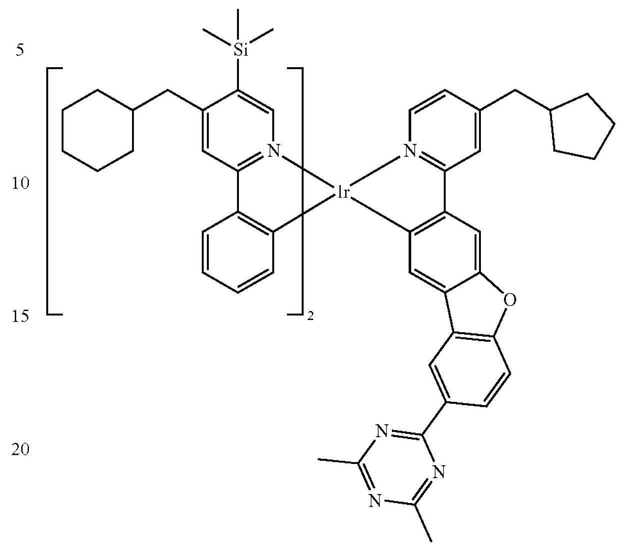
669
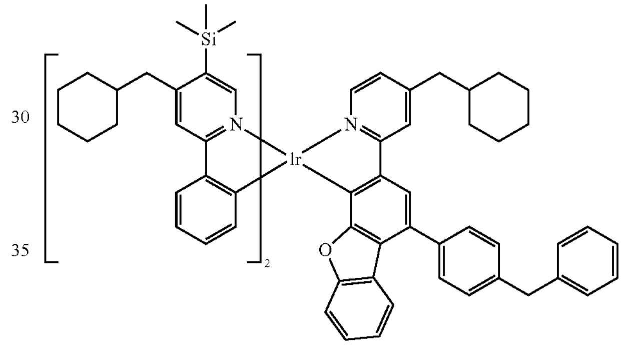
670
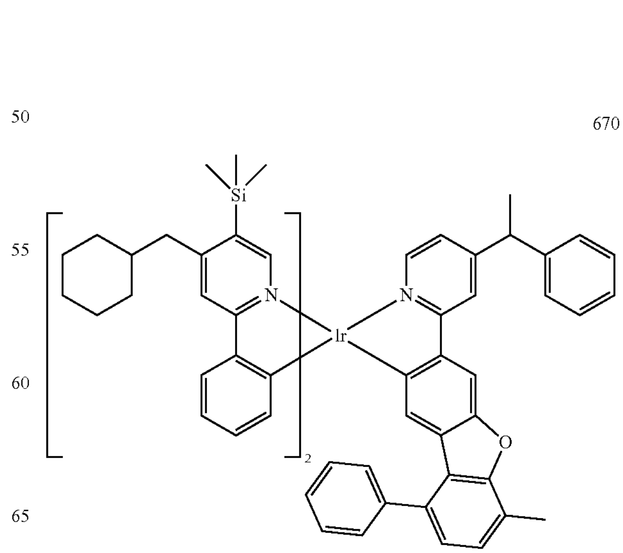

671
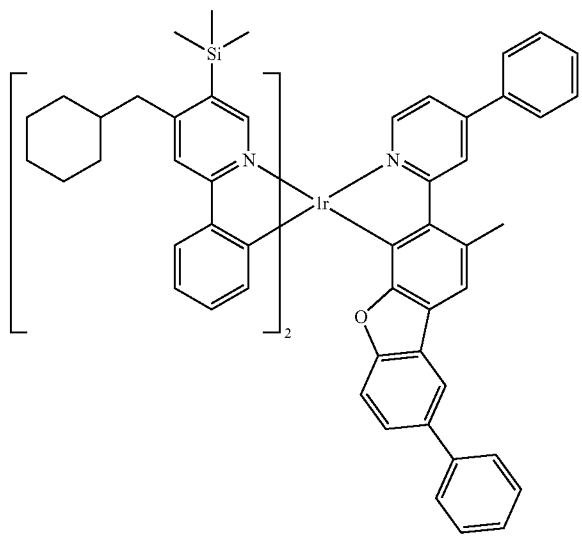
672
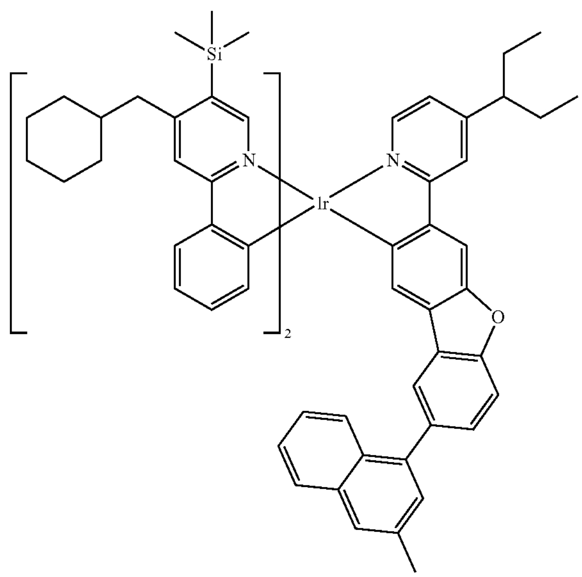
673
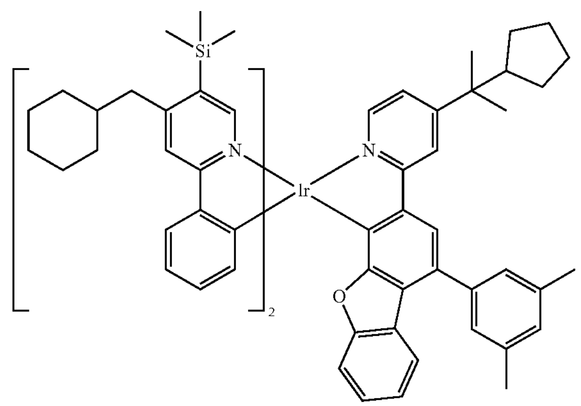
674
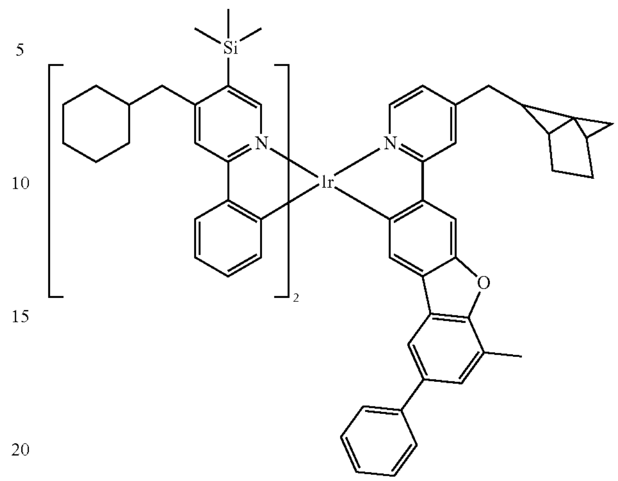
675
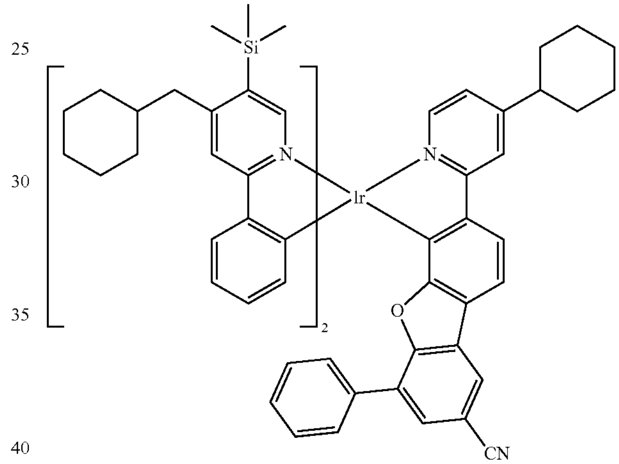
676
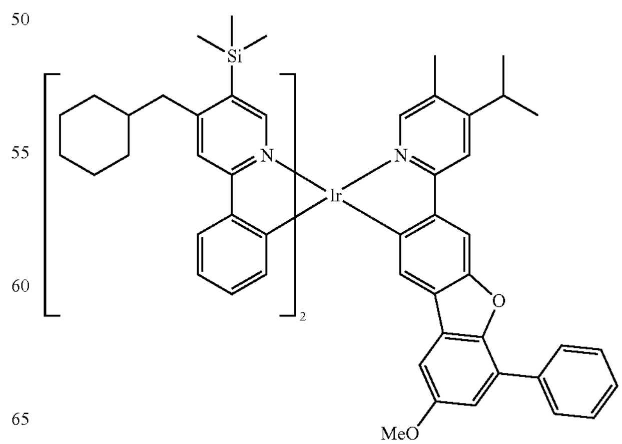

-continued
677
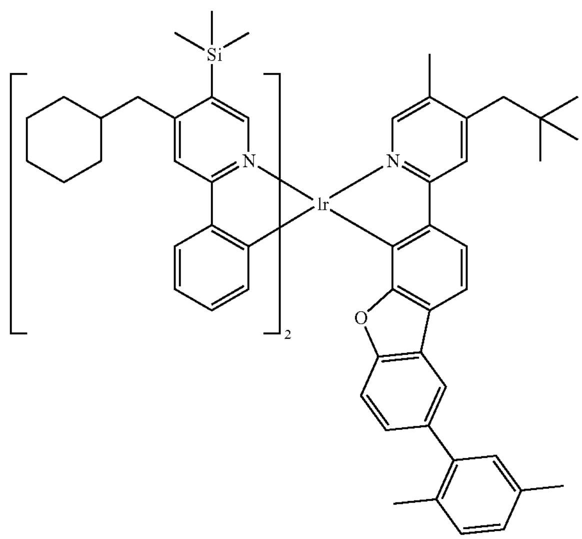
678
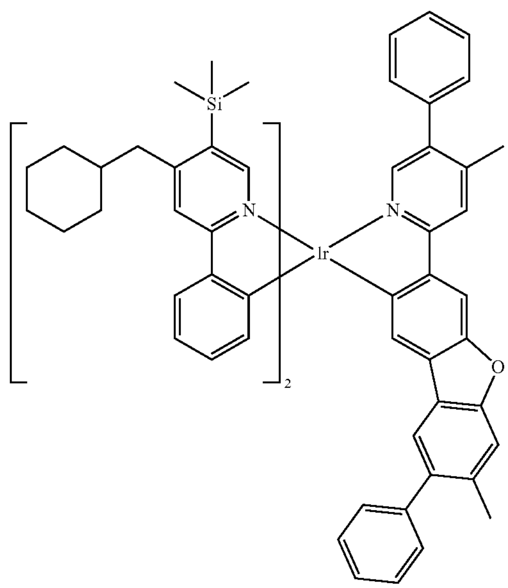
679
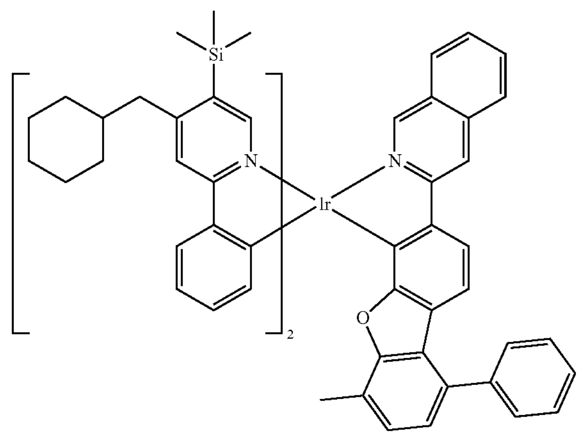
-continued
680
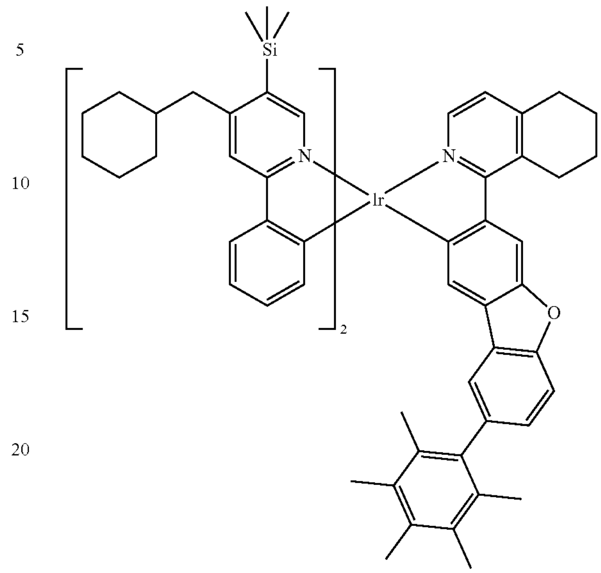
681
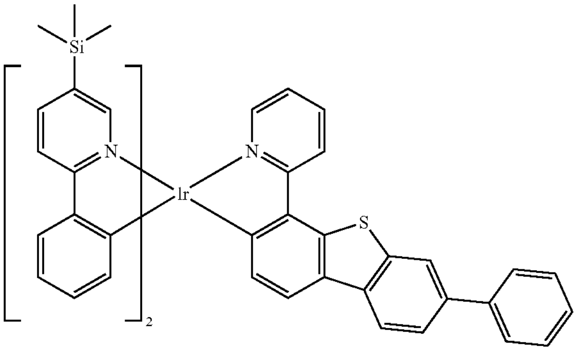
682
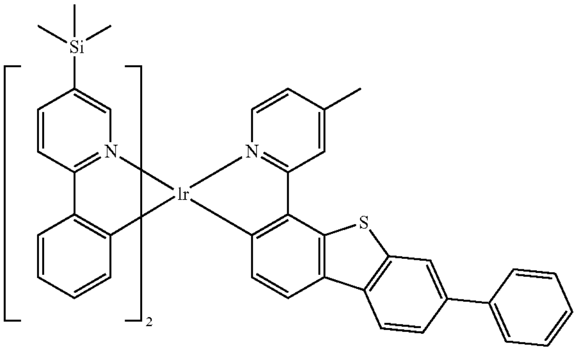

-continued
683
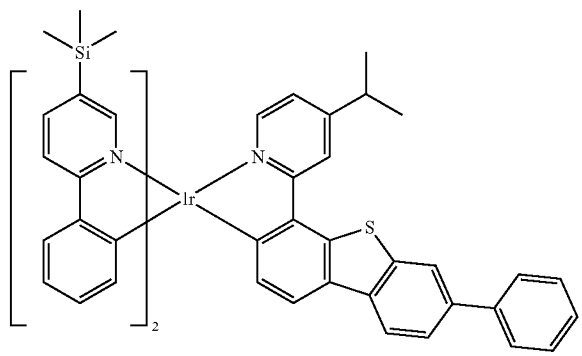
684
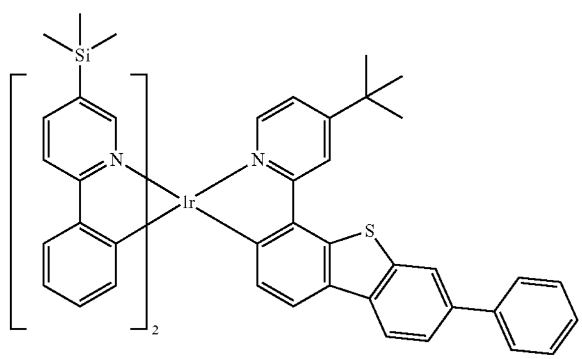
685
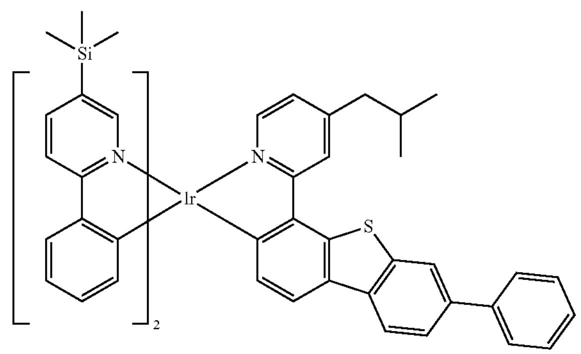
686
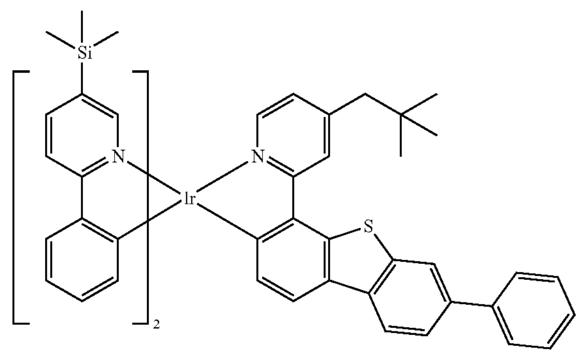
-continued
687
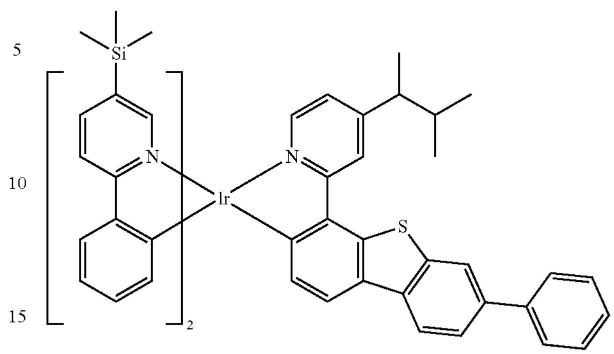
688
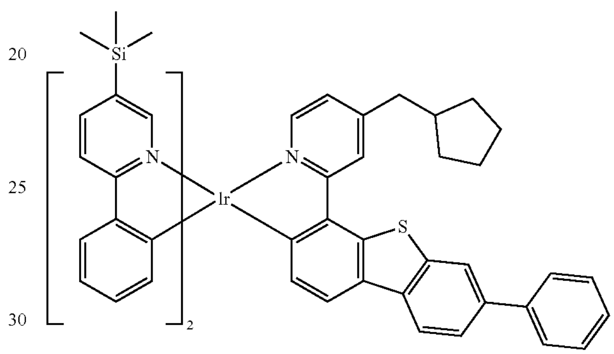
689
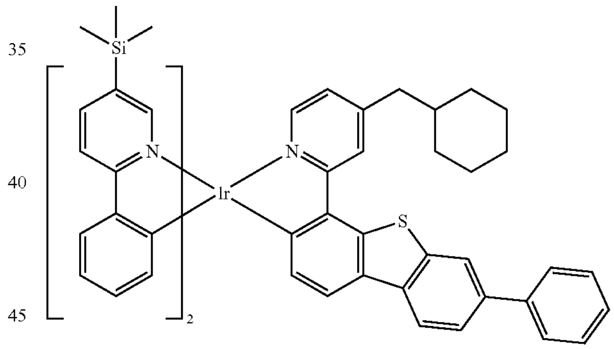
690
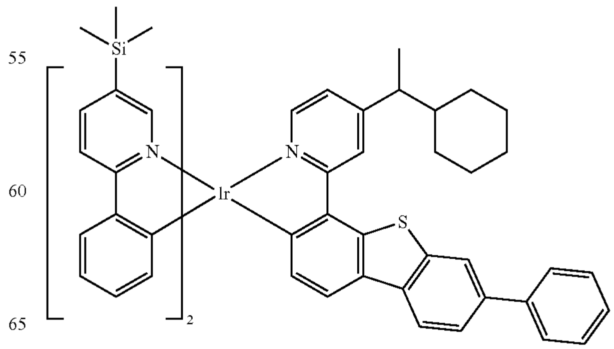

-continued
691
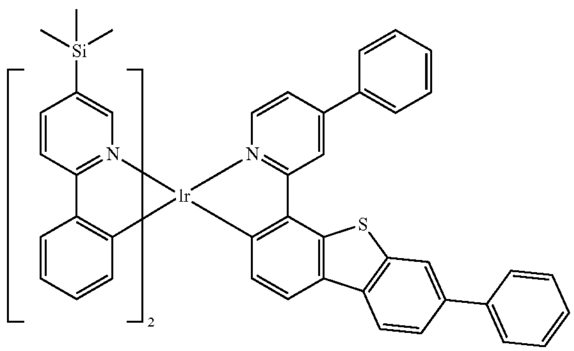
692
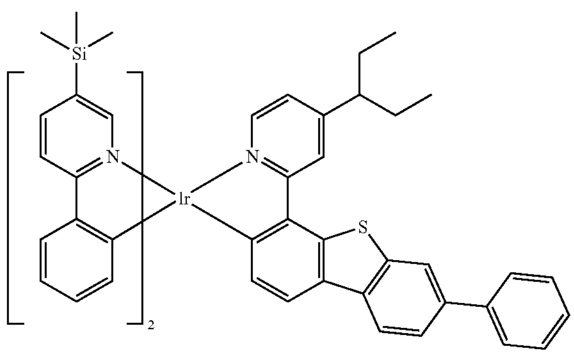
693
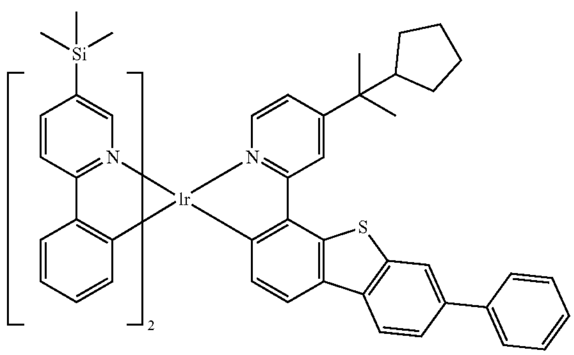
694
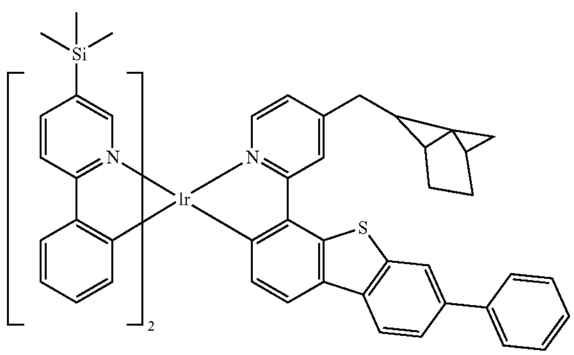
-continued
695
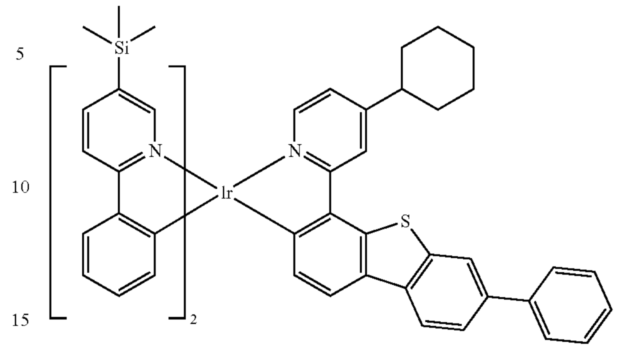
696
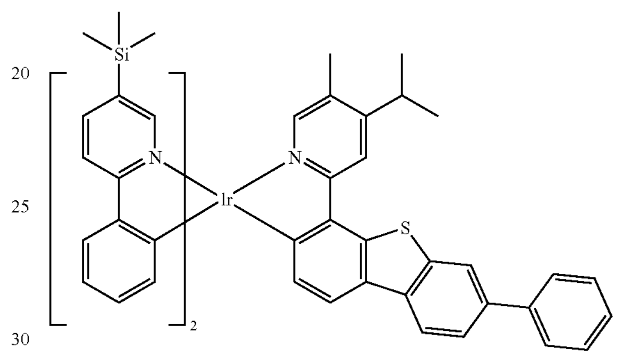
697
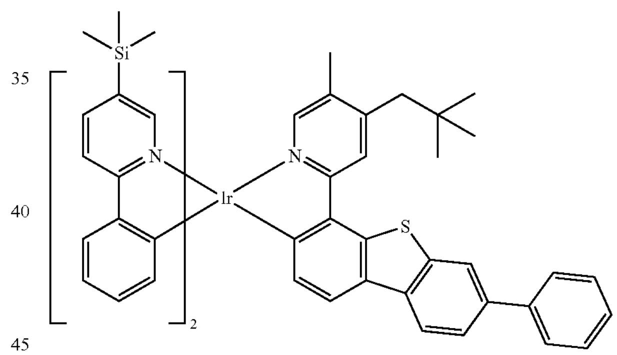
698
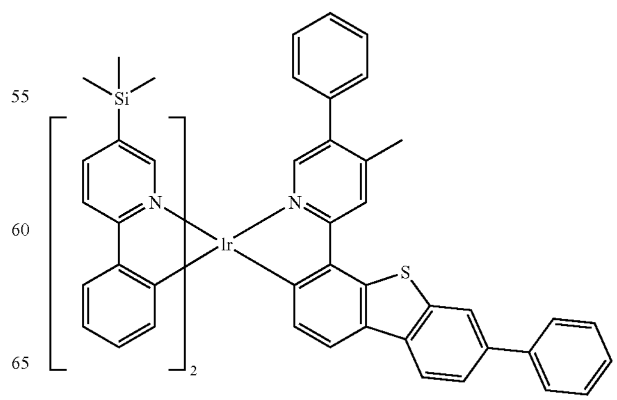

699
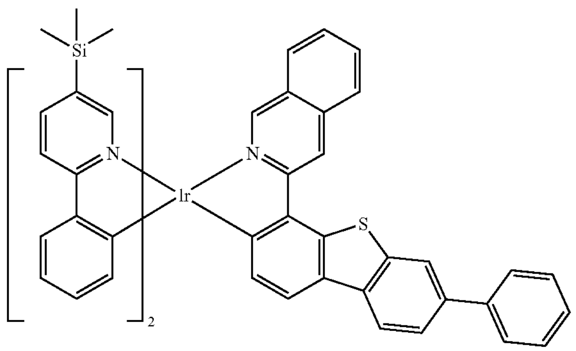
700
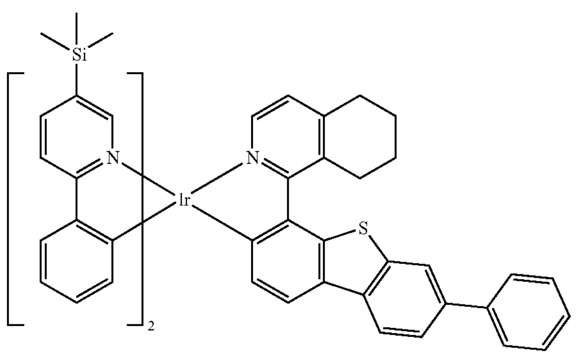
701
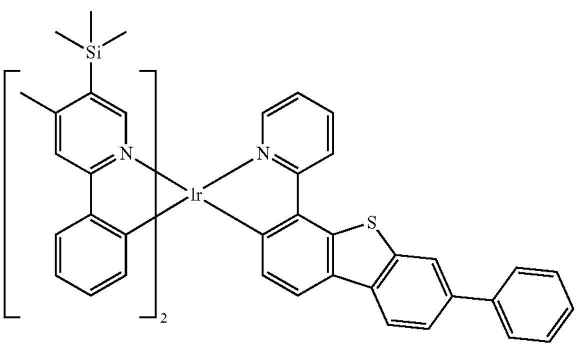
702
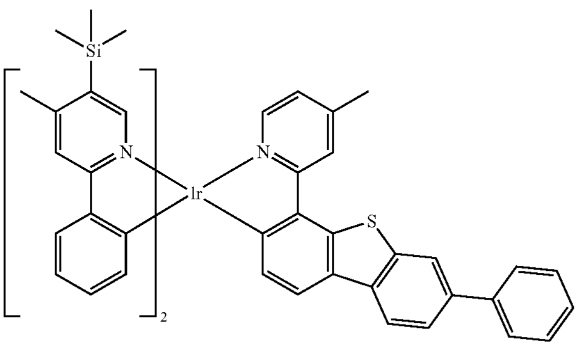
703
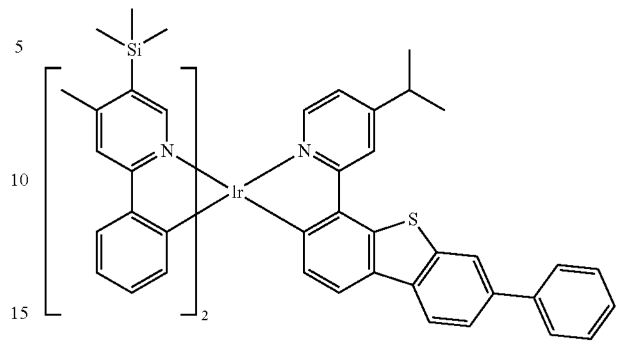
704
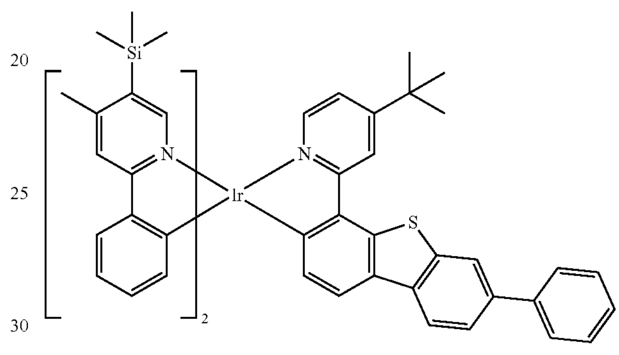
705
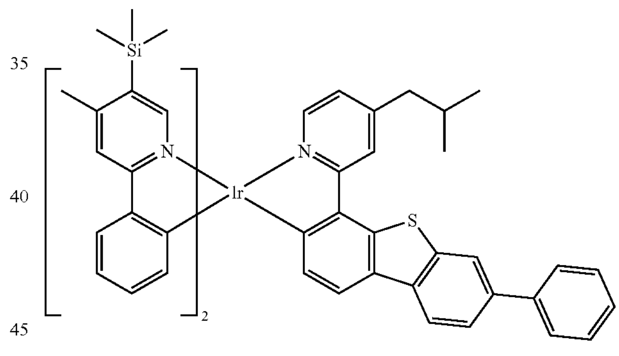
706
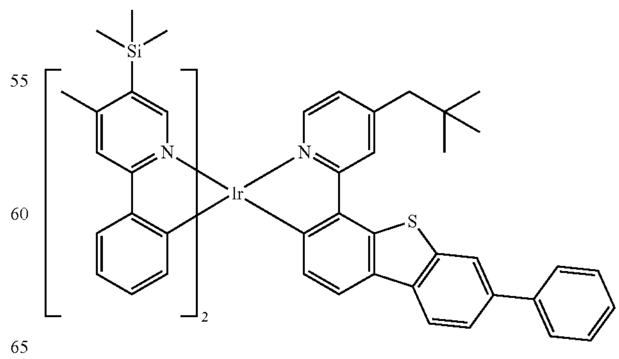

-continued
707
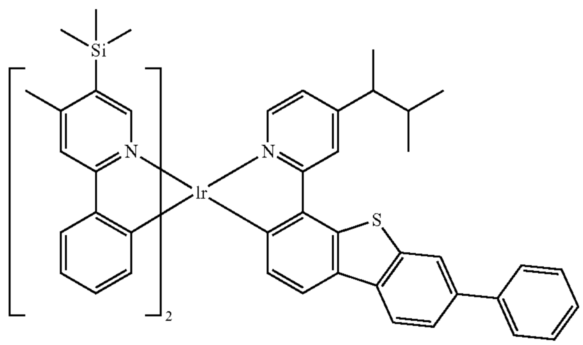
708
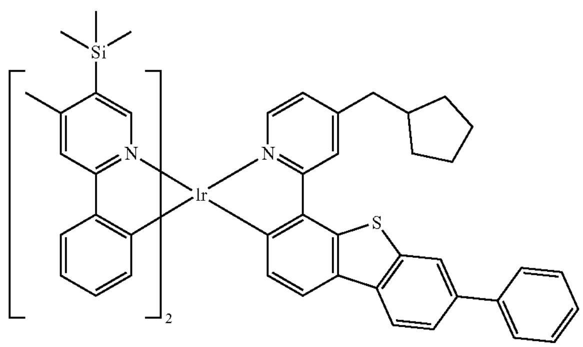
709
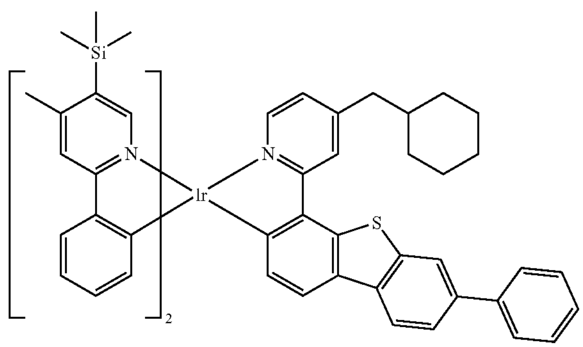
710
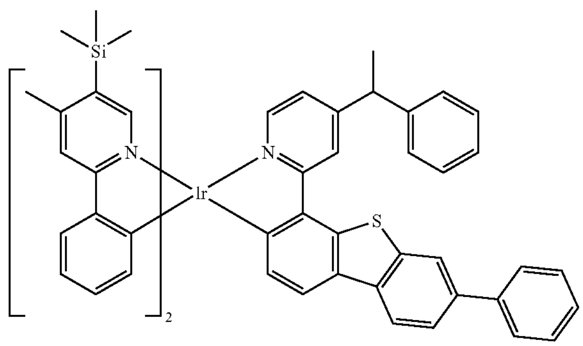
-continued
711
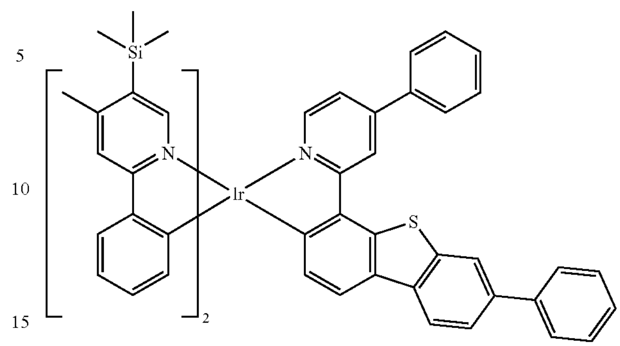
712
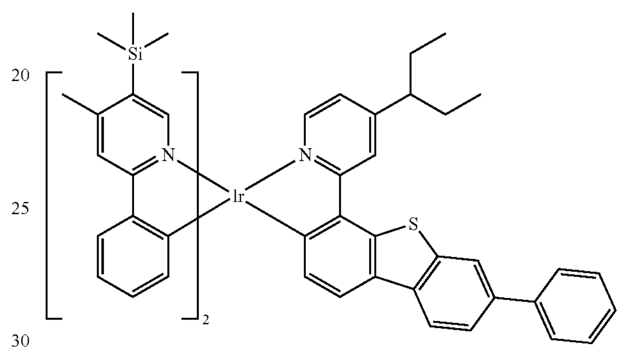
713
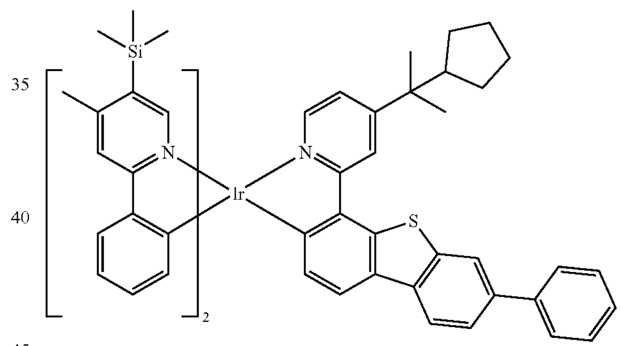
714
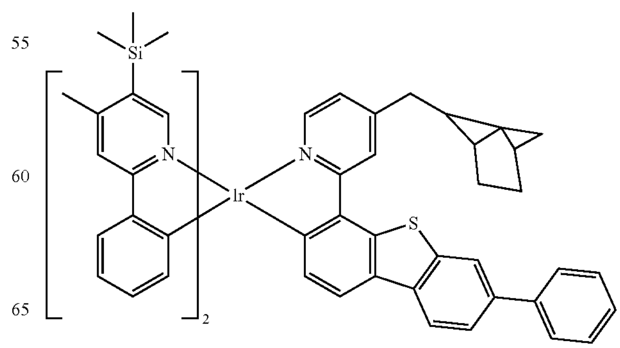

-continued
715
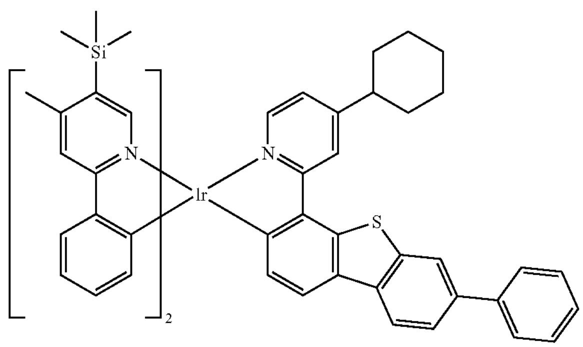
716
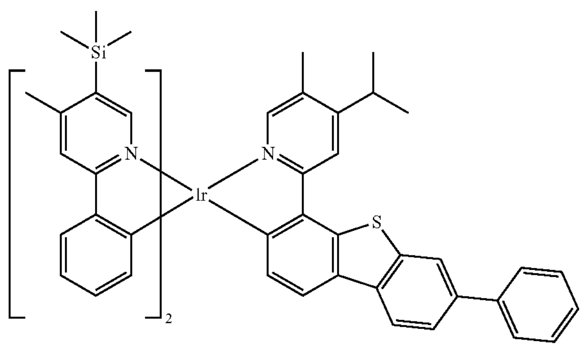
717
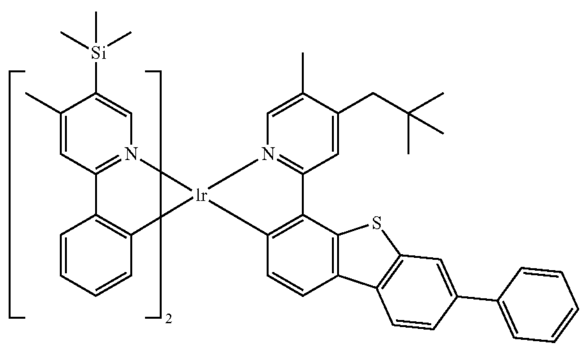
718
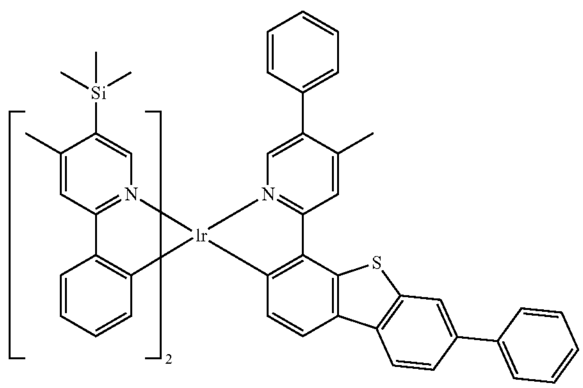
-continued
719
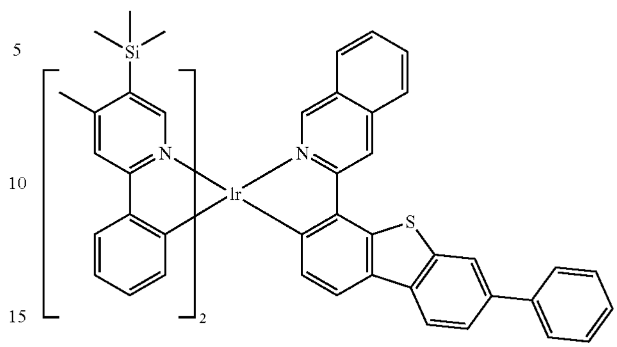
720
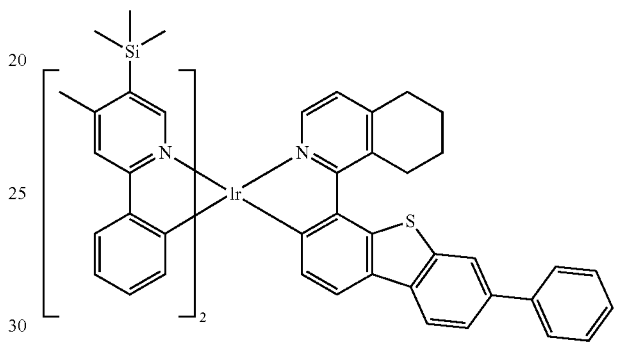
721
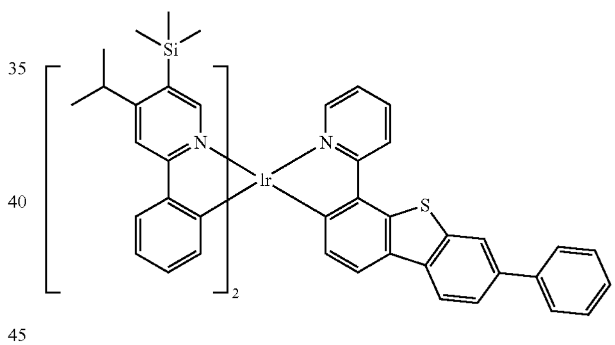
722
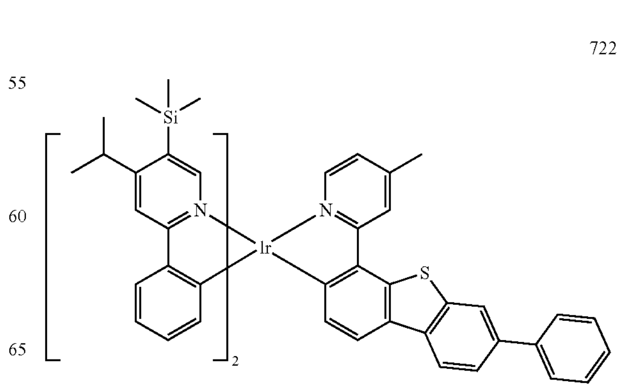

-continued
723
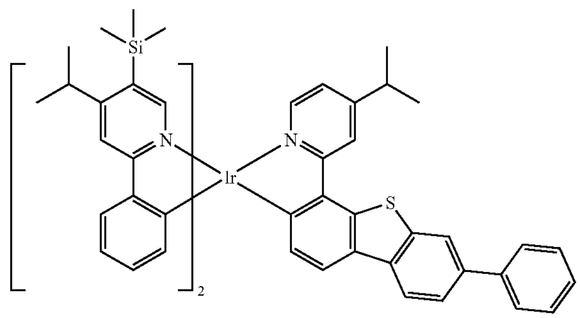
724
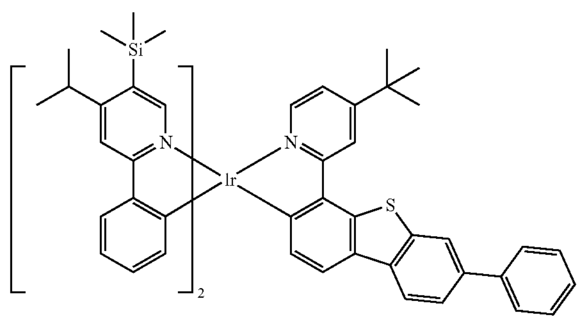
725
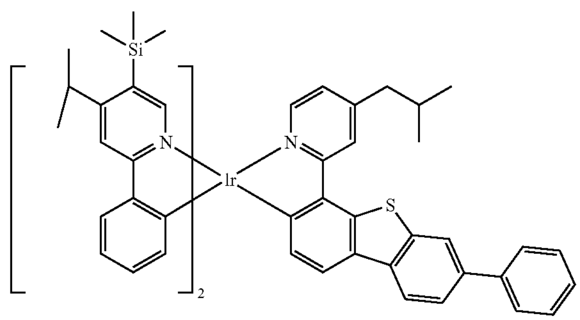
726
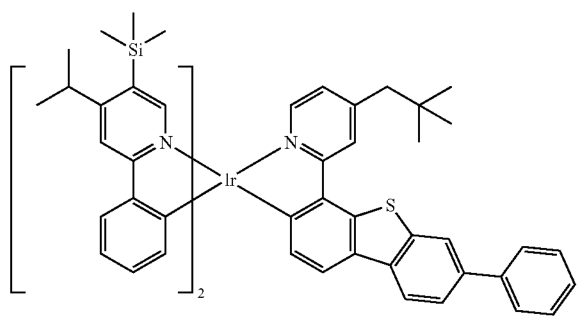
-continued
727
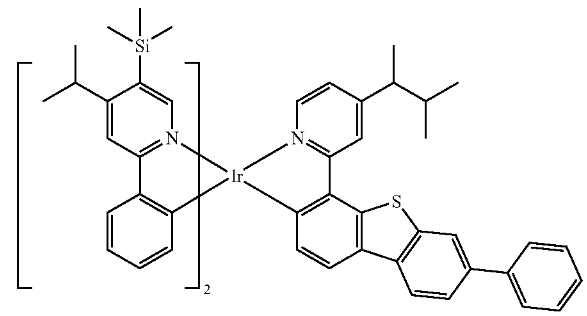
728
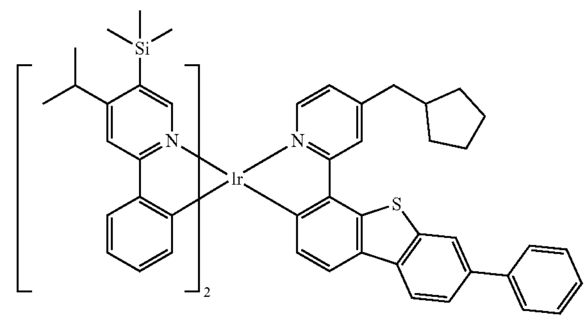
729
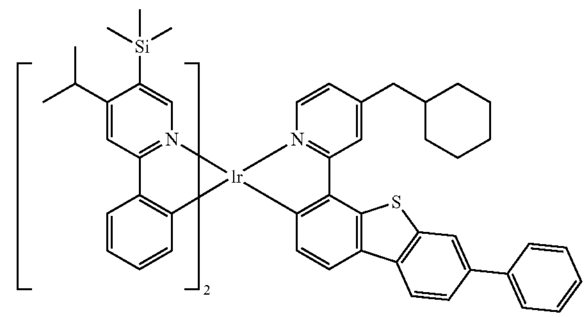
730
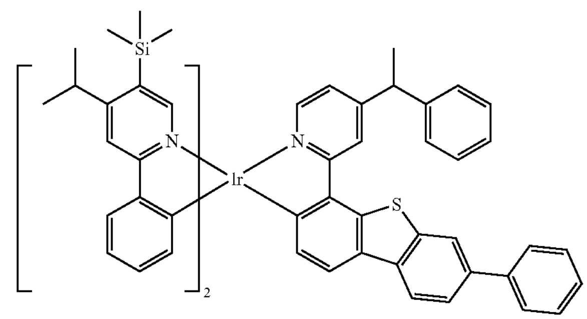

-continued
731
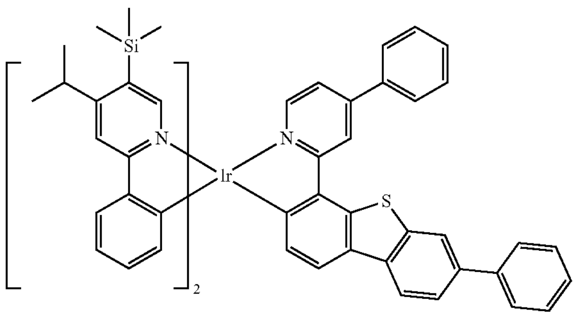
732
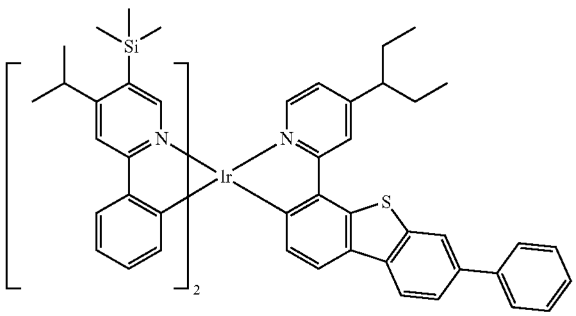
733
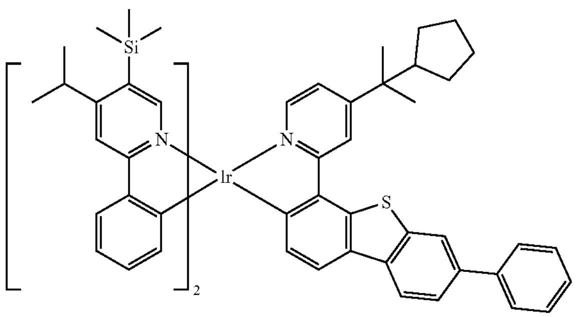
734
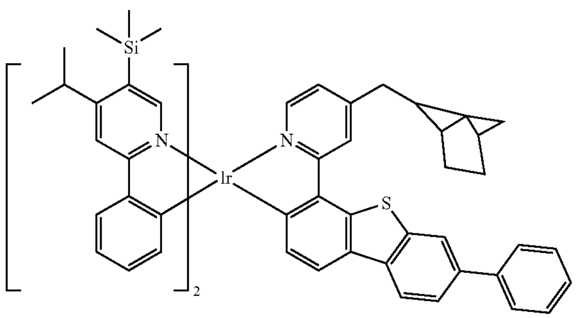
-continued
735
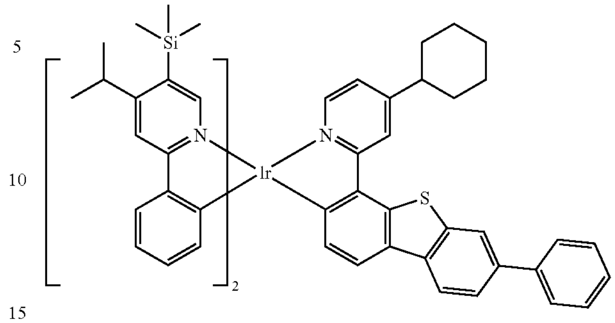
736
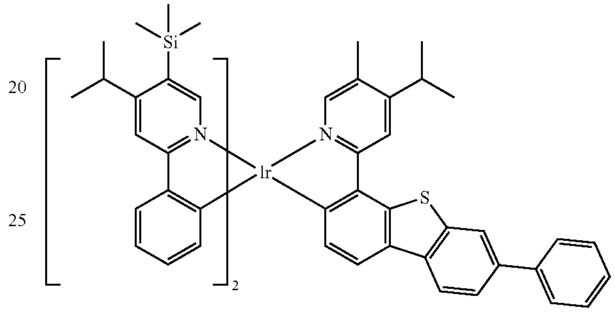
737
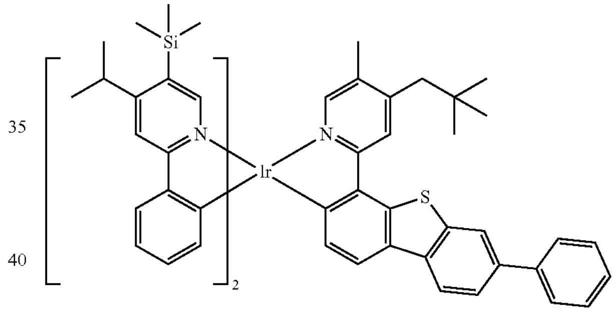
738
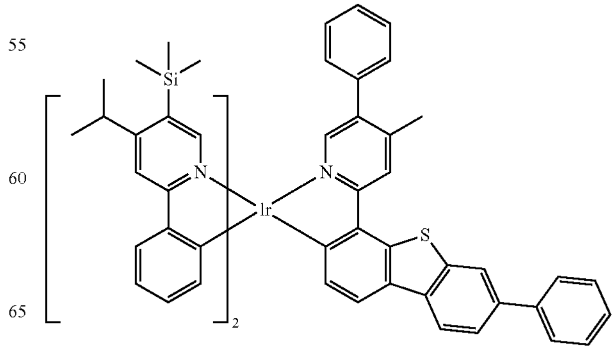

-continued
739
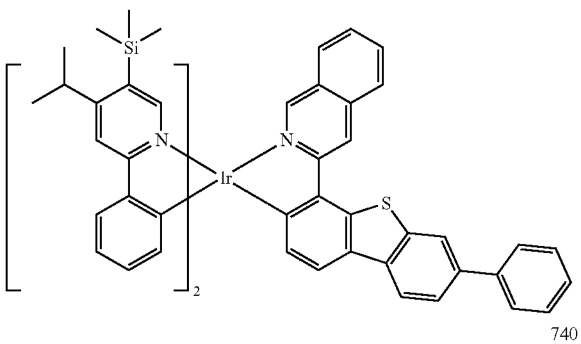
740
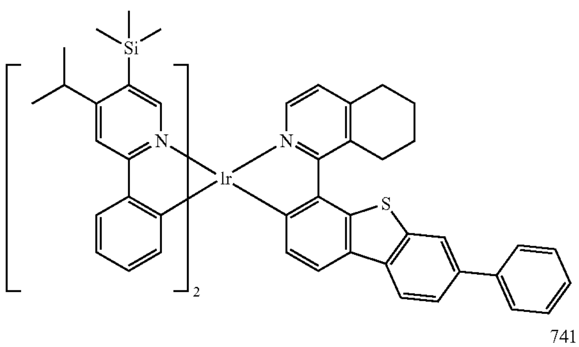
741
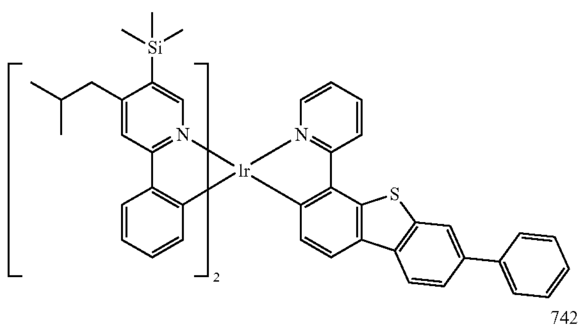
742
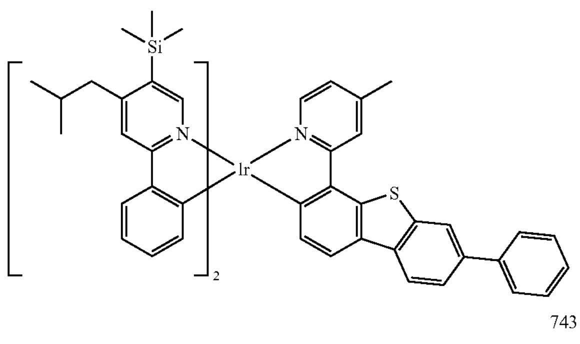
743
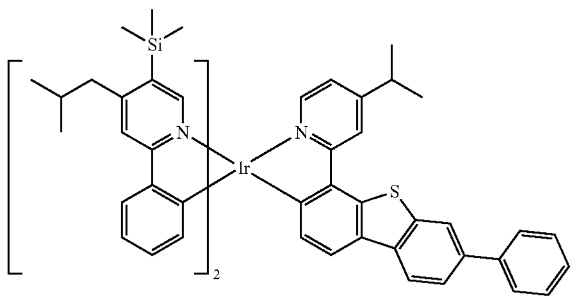
-continued
744
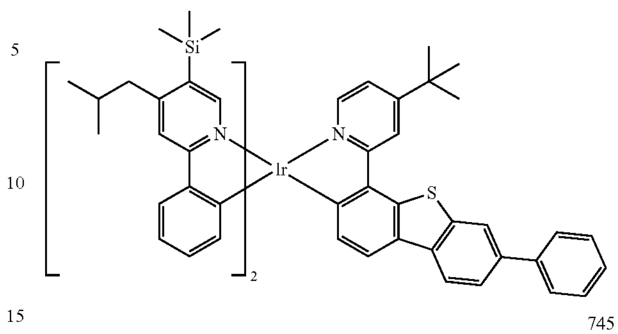
745
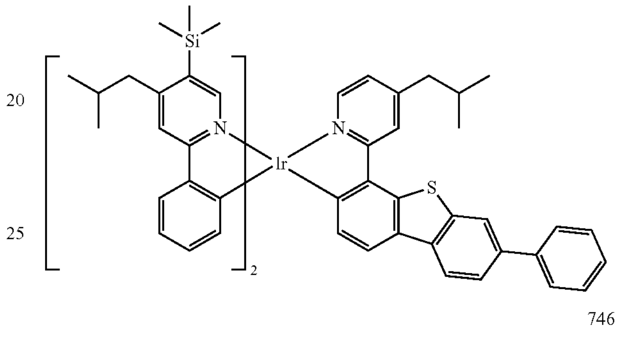
746
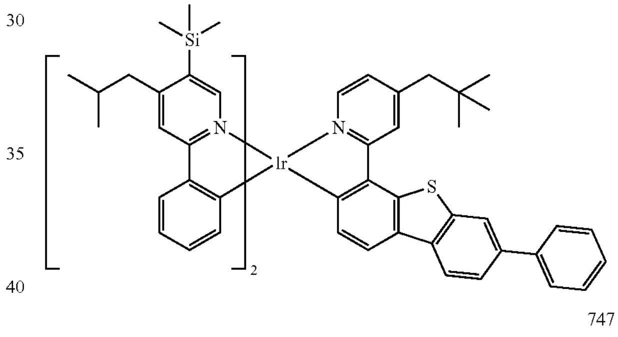
747
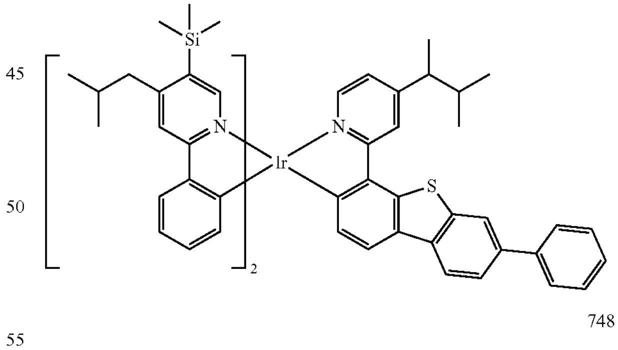
748
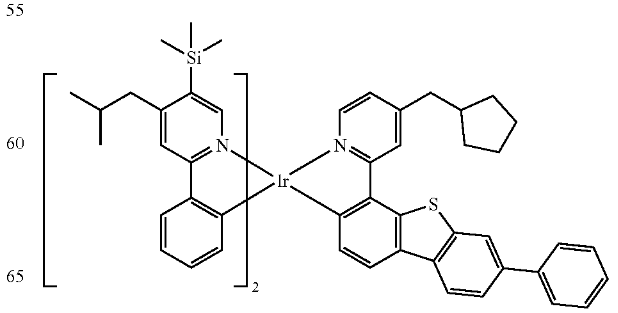

-continued
749
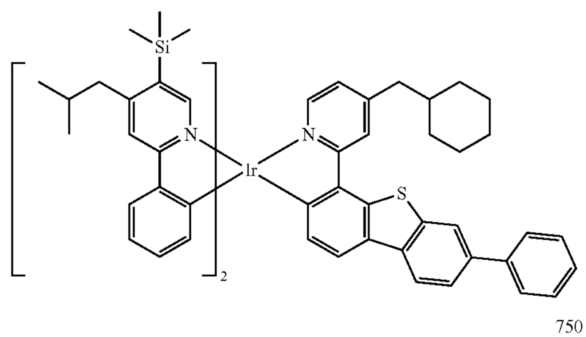
750
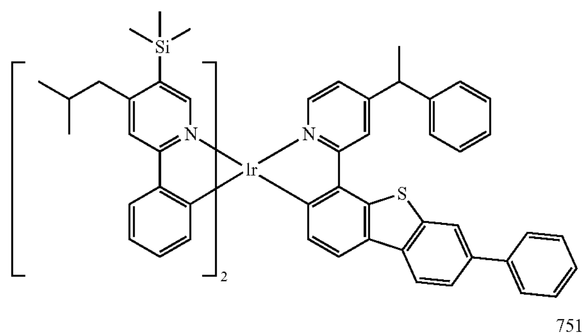
751
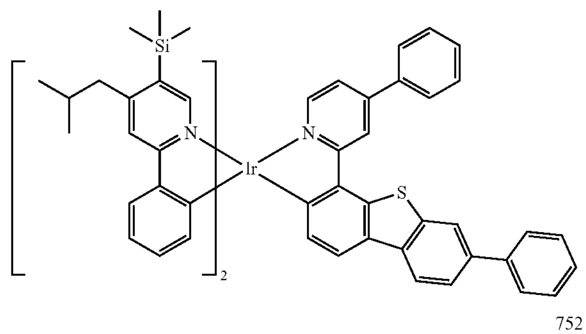
752
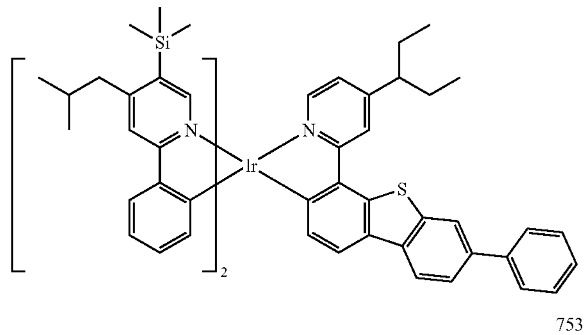
753
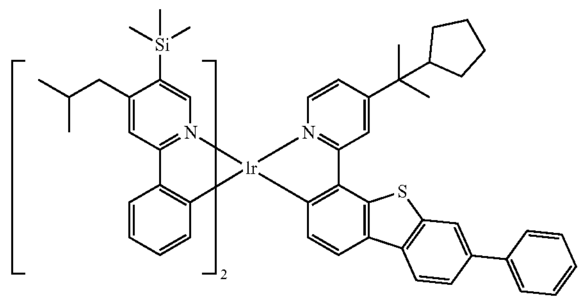
-continued
754
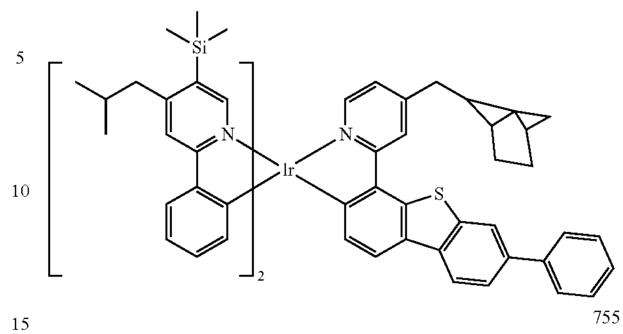
755
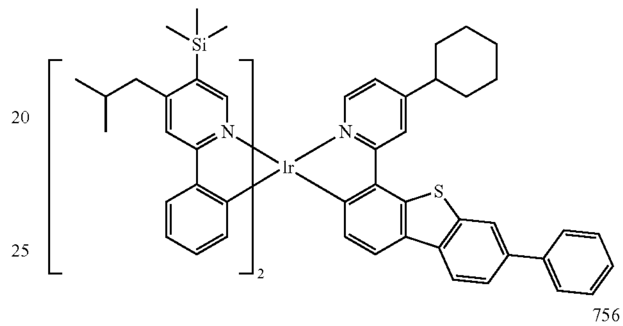
756
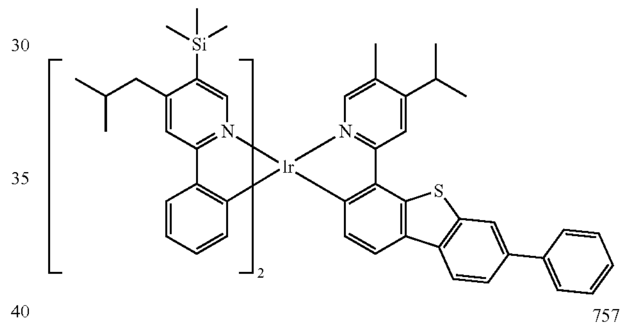
757
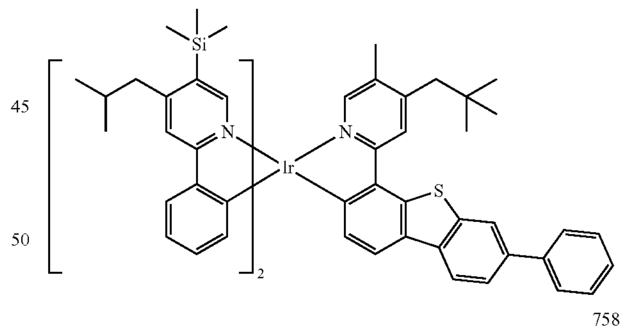
758
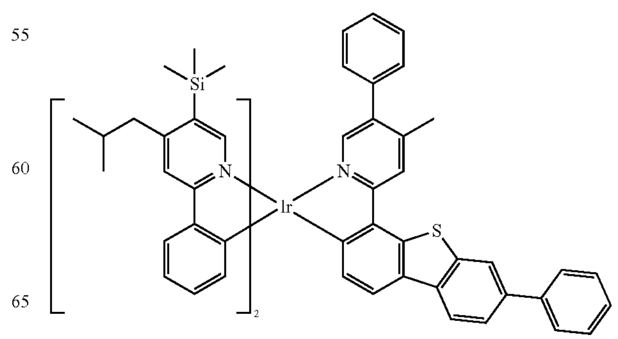

-continued
759
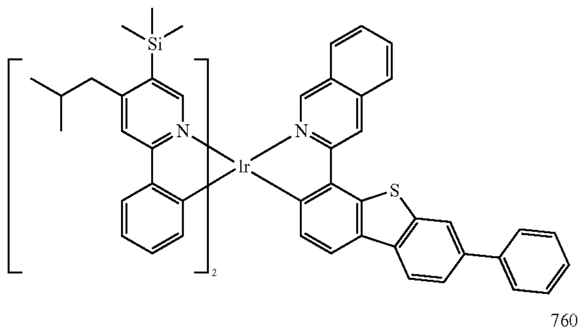
760
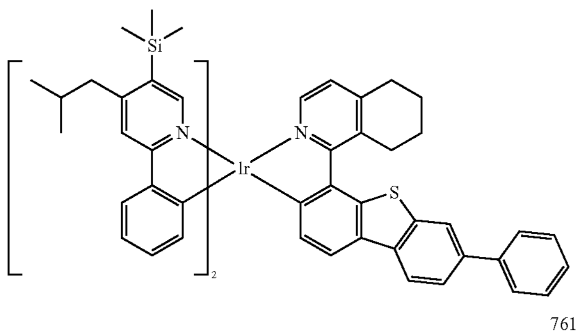
761
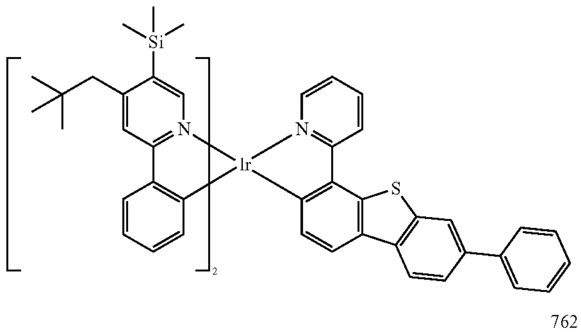
762
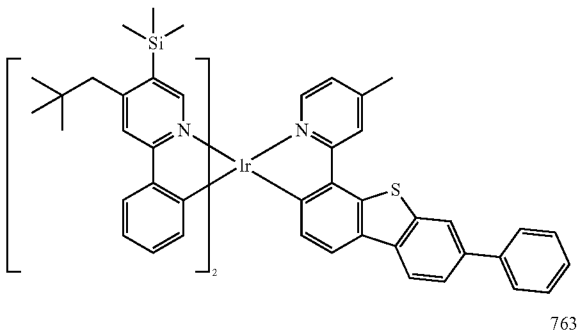
763
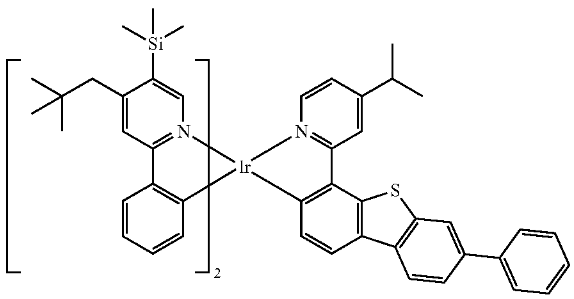
-continued
764
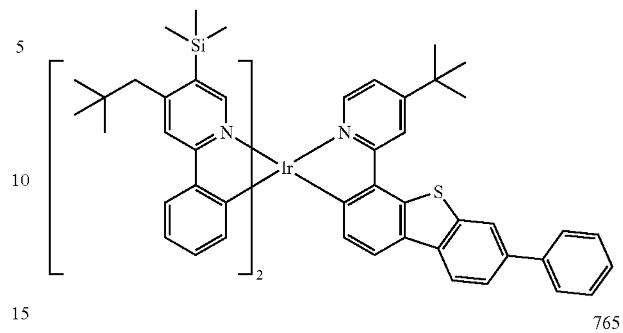
765
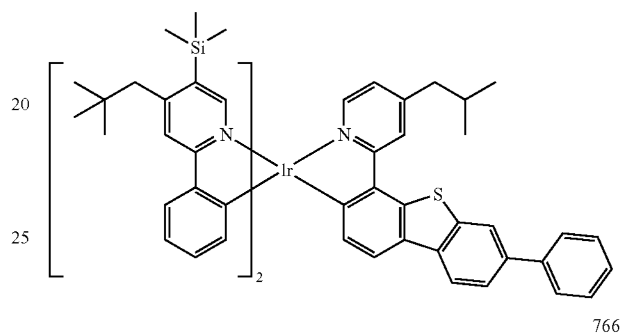
766
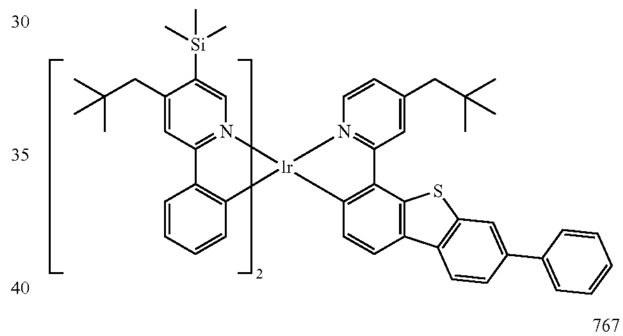
767
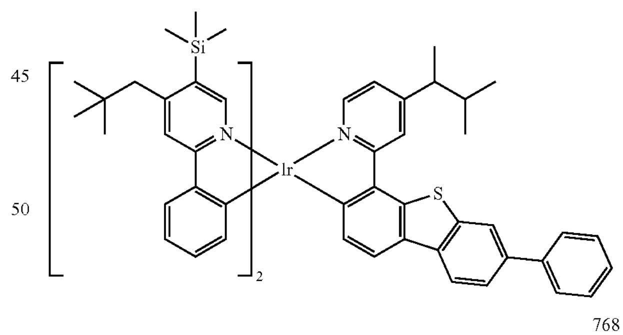
768
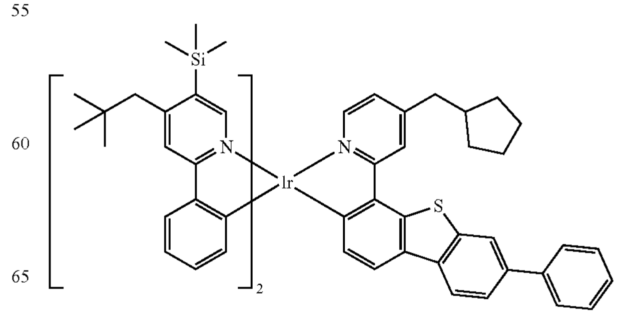

-continued
769
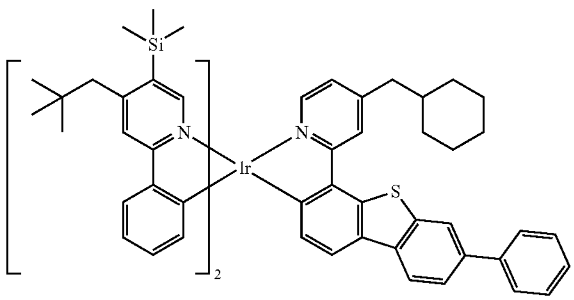
770
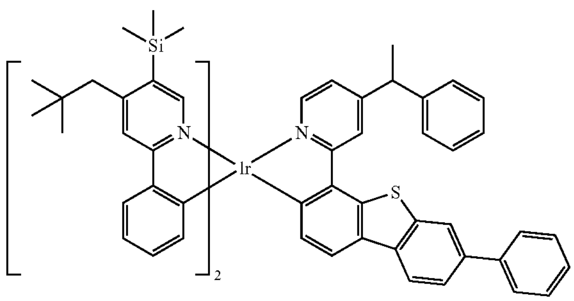
771
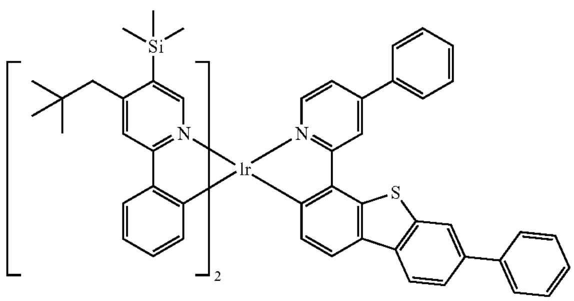
772
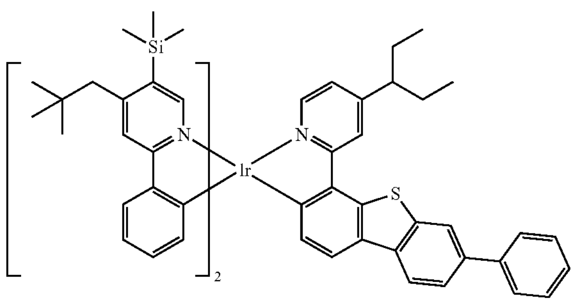
773
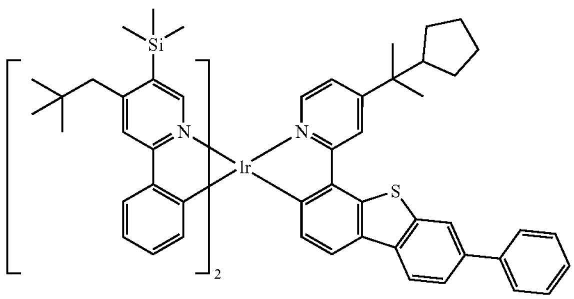
-continued
774
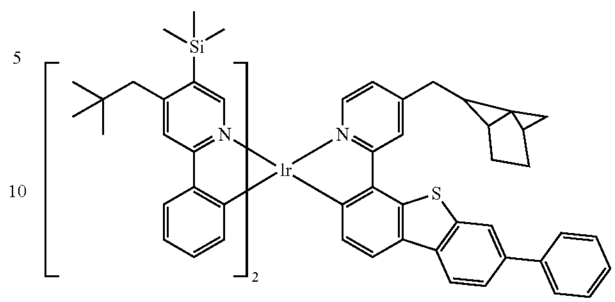
775
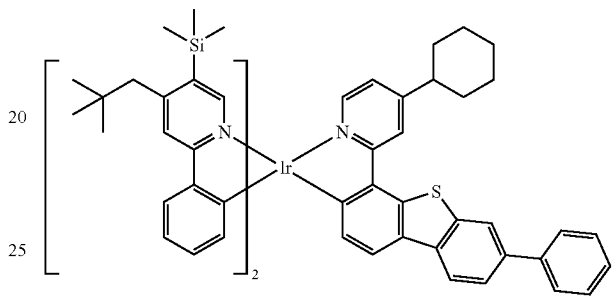
776
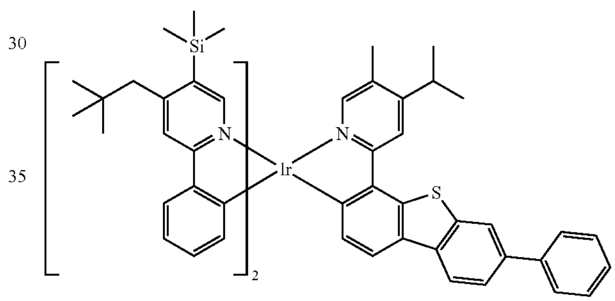
777
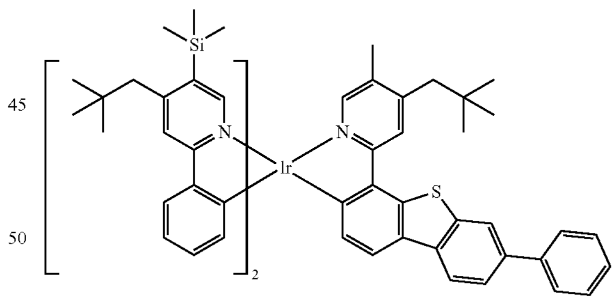
778
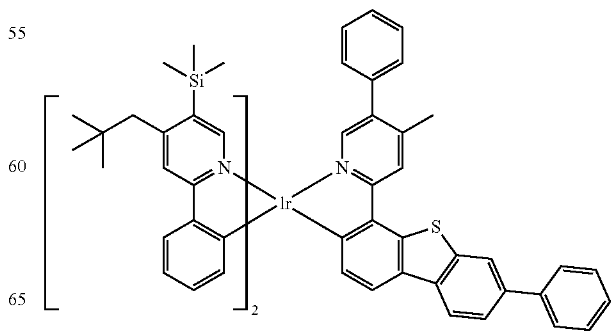

-continued
779
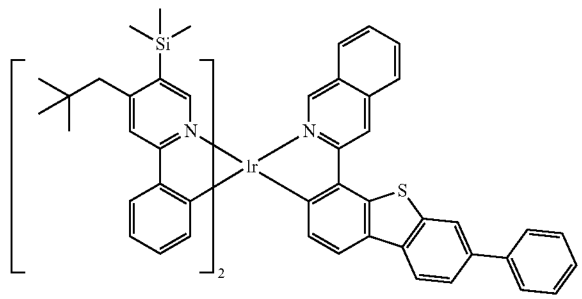
780
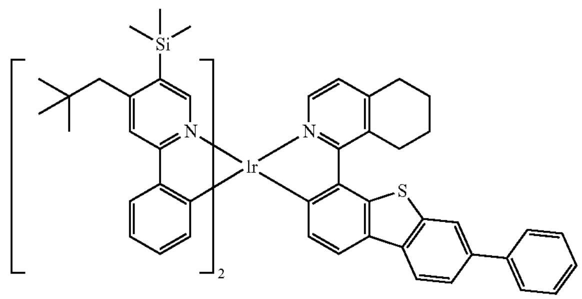
781
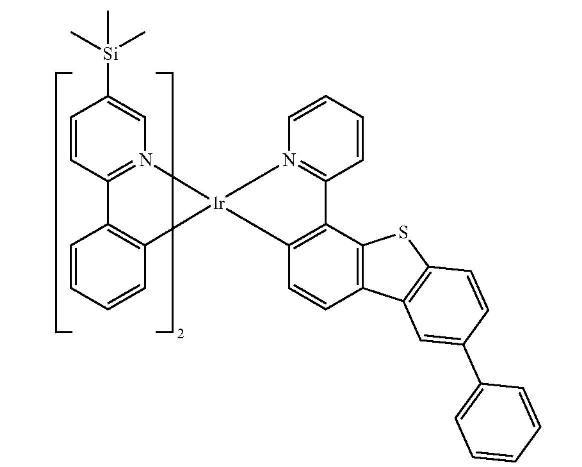
782
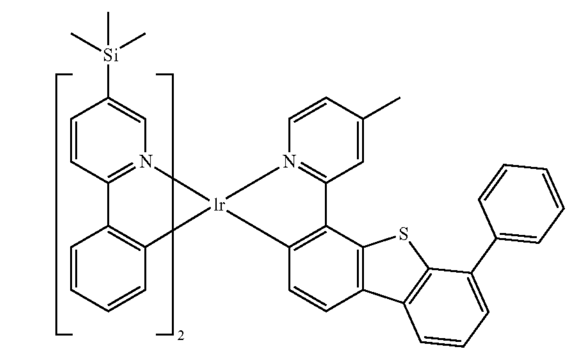
-continued
783
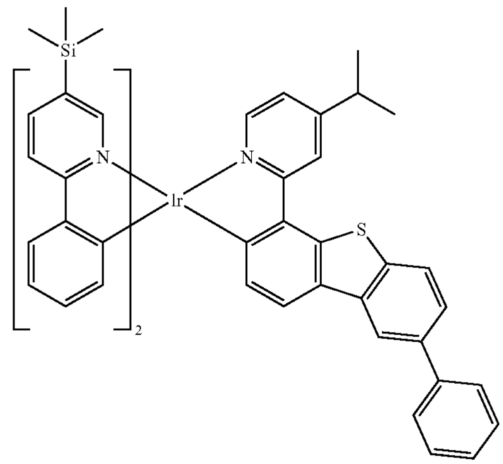
784
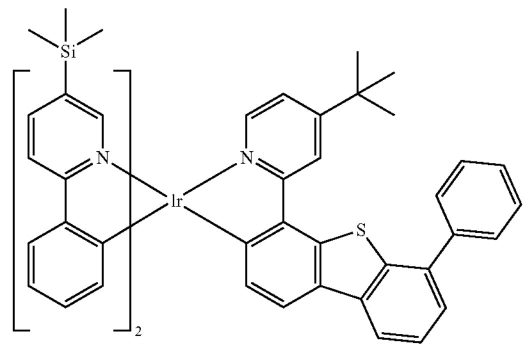
785
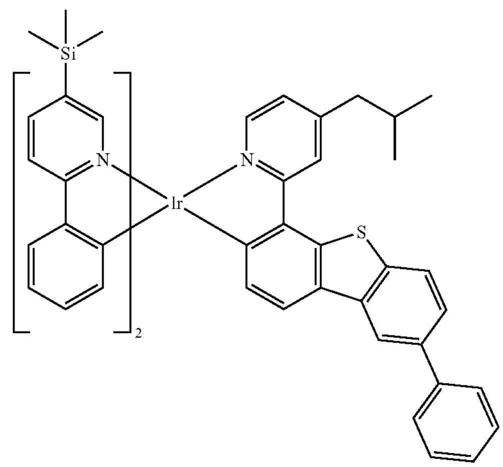

-continued
786
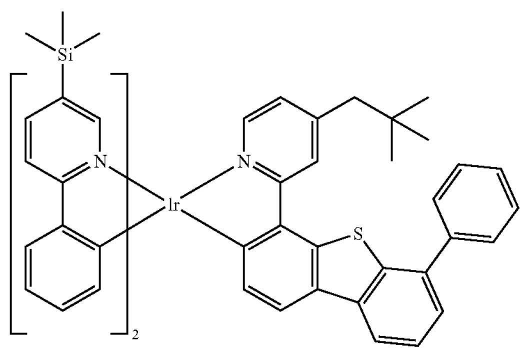
787
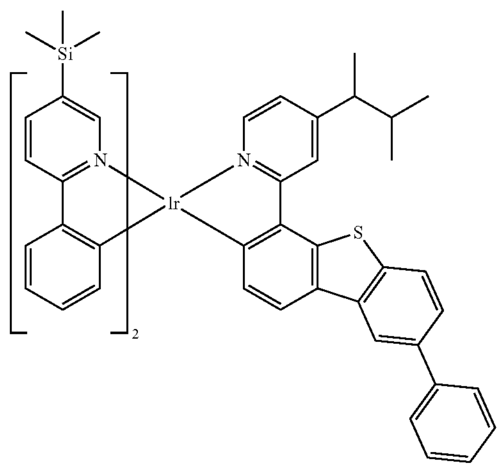
788
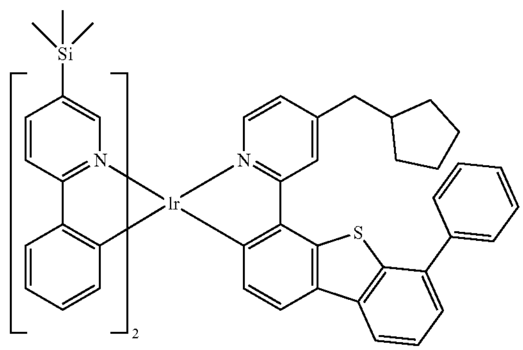
-continued
789
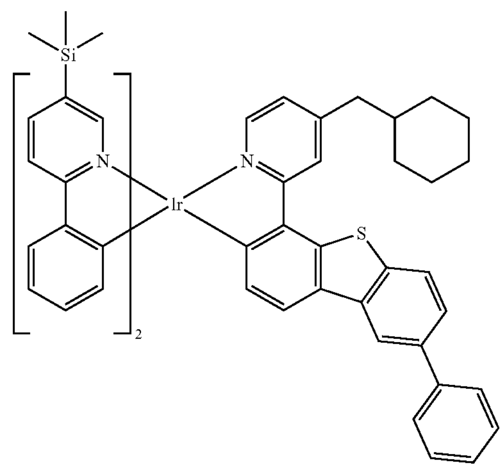
790
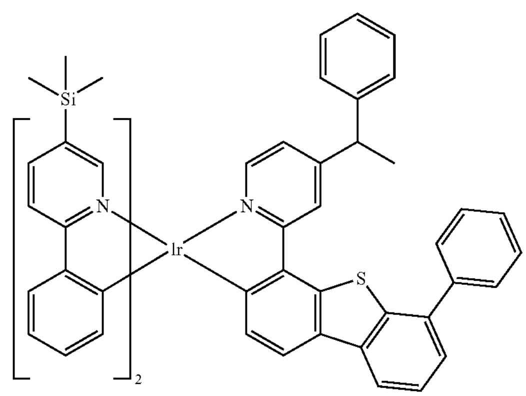
791
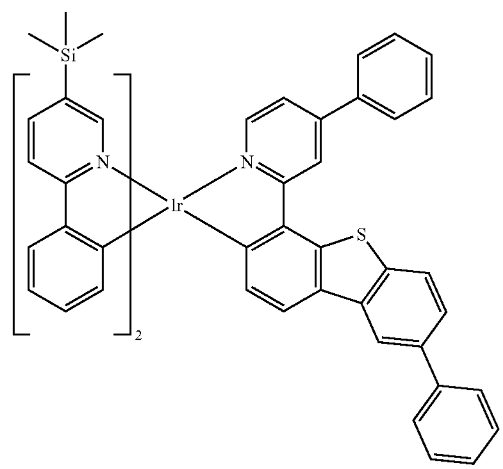

-continued
792
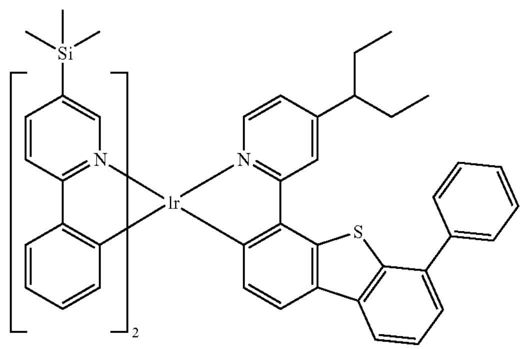
793
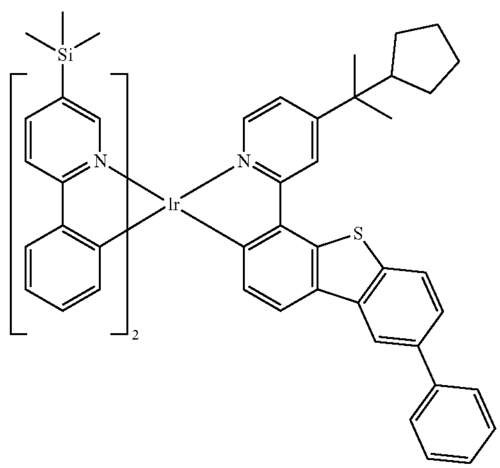
794
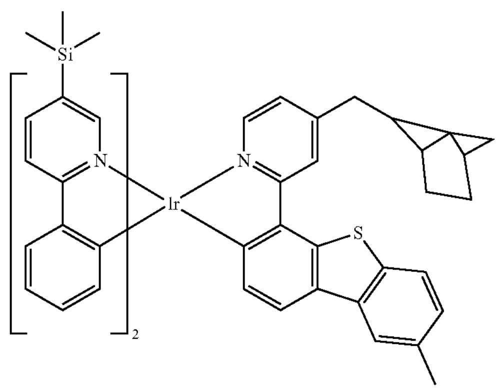
795
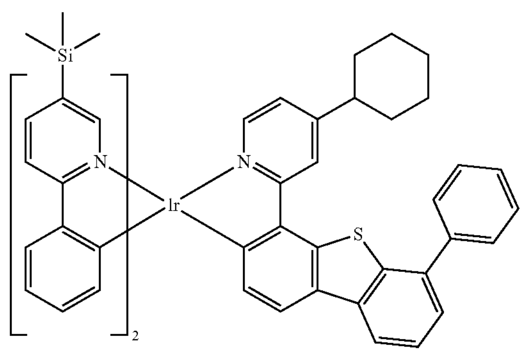
-continued
796
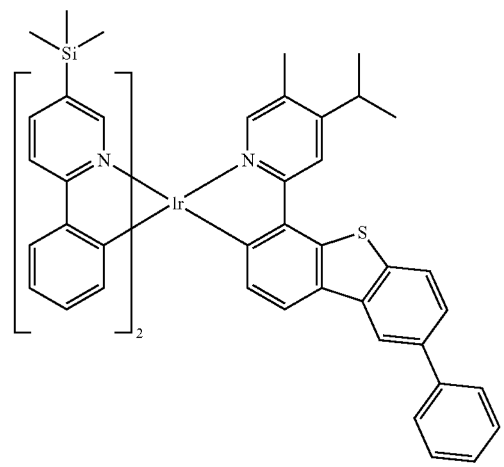
797
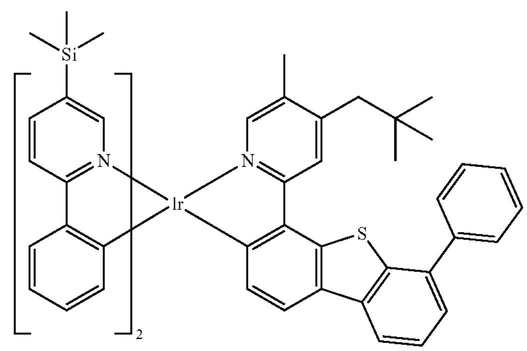
798
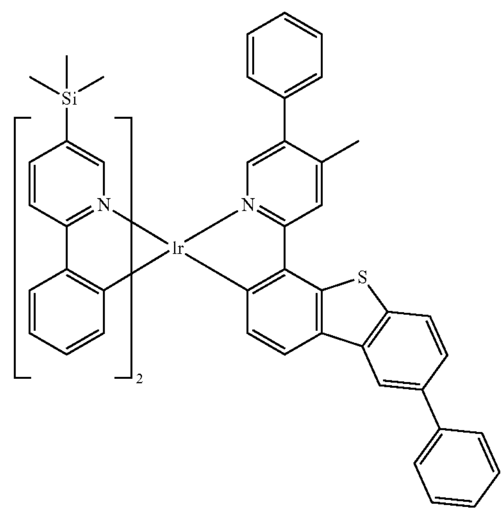

-continued
799
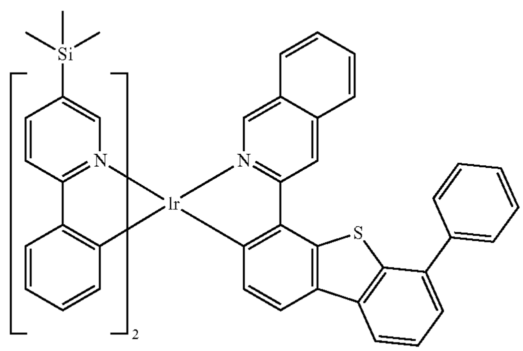
800
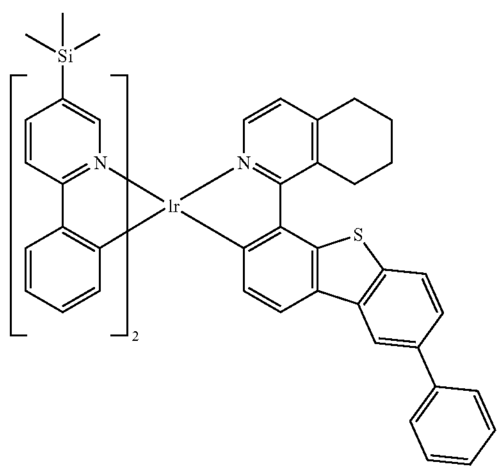
801
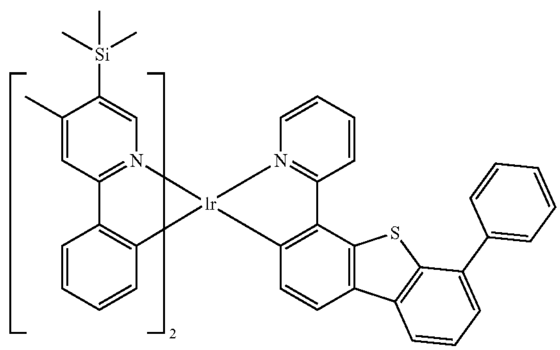
-continued
802
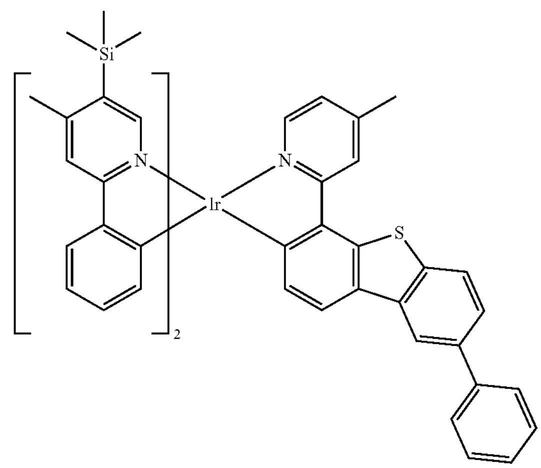
803
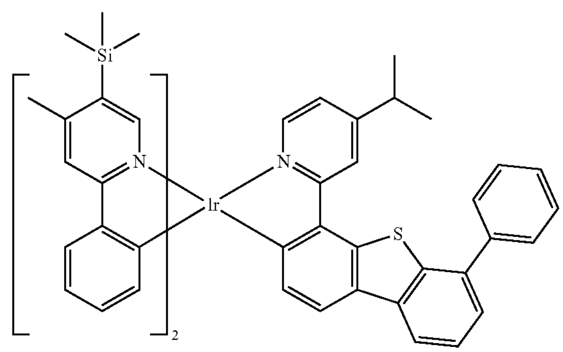
804
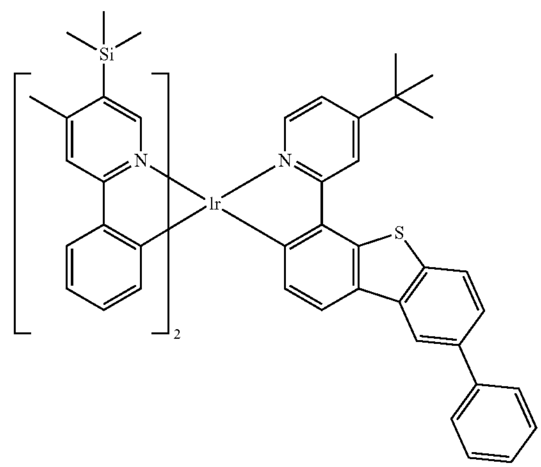

-continued
805
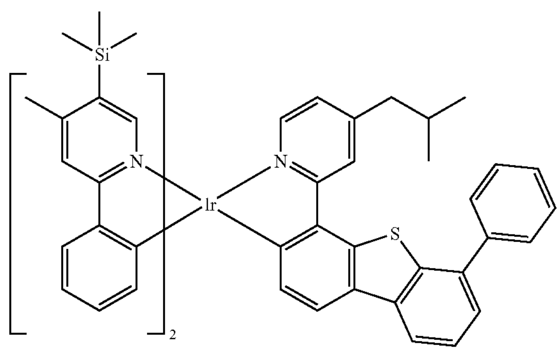
806
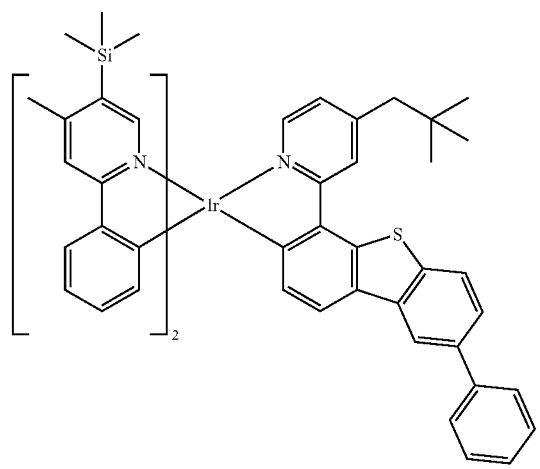
807
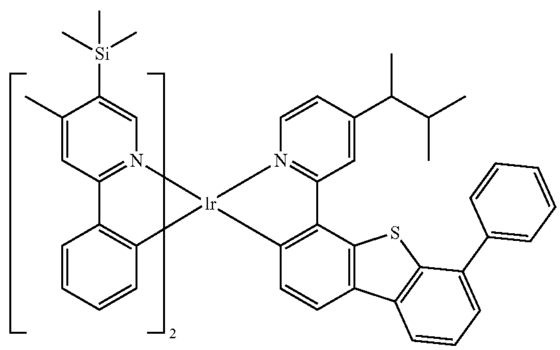
-continued
808
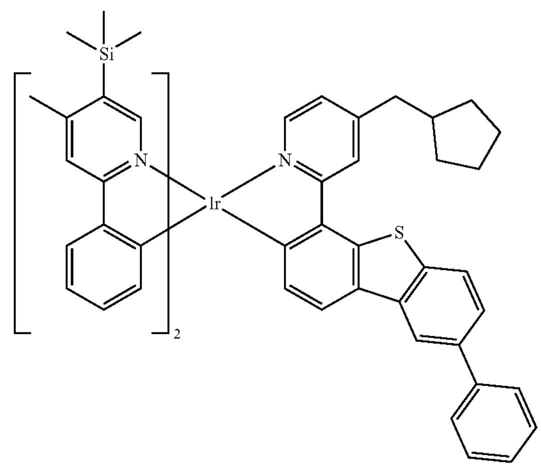
809
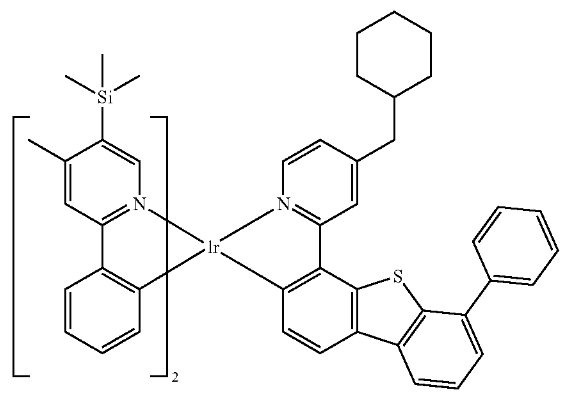
810
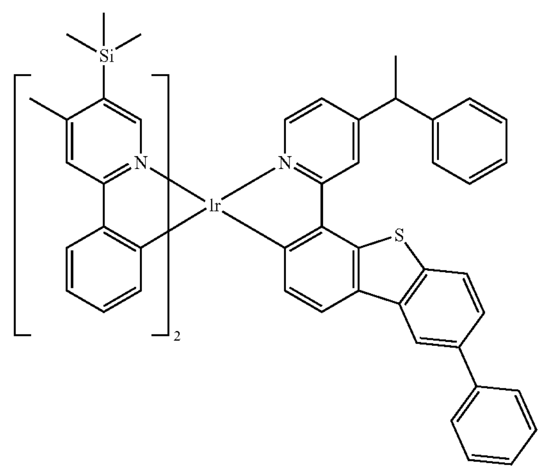

-continued
811
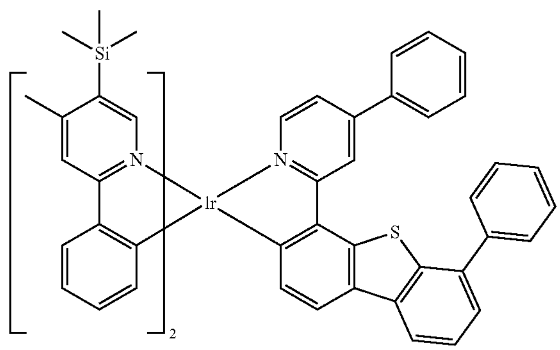
812
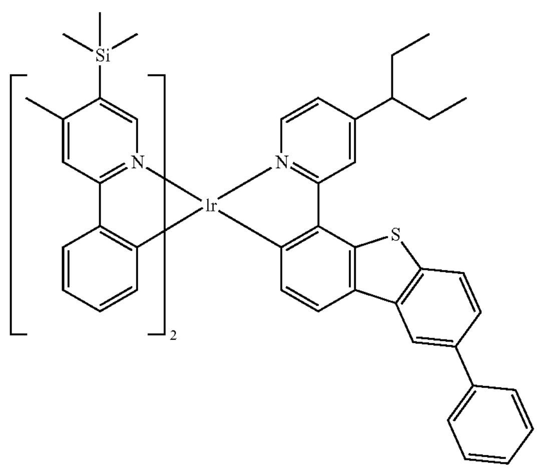
813
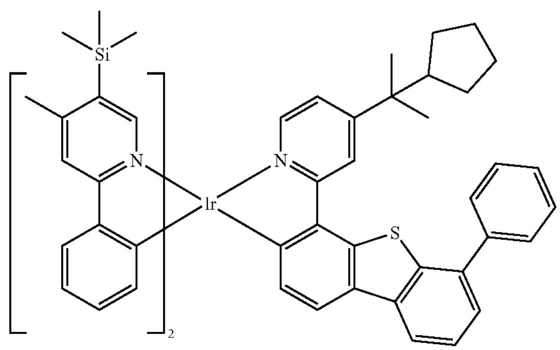
-continued
814
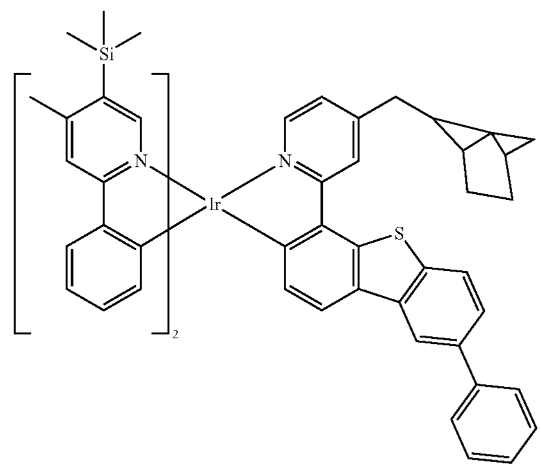
815
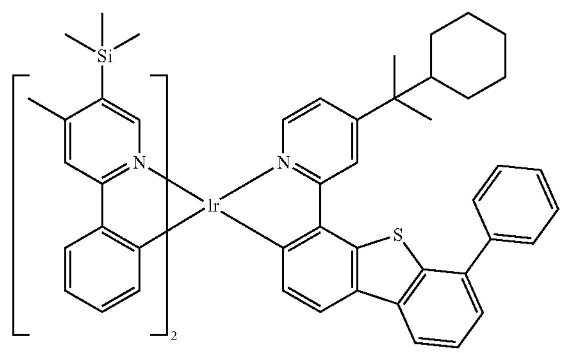
816
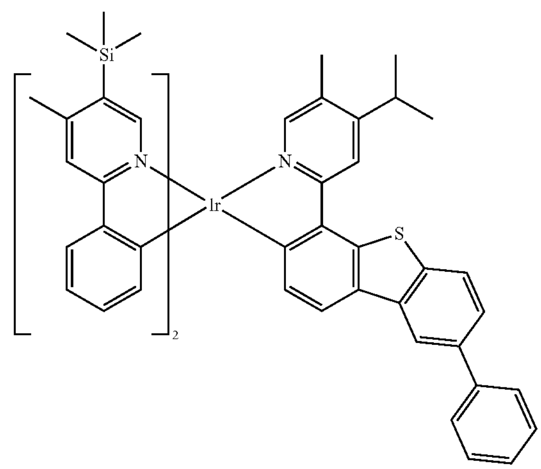

-continued
817
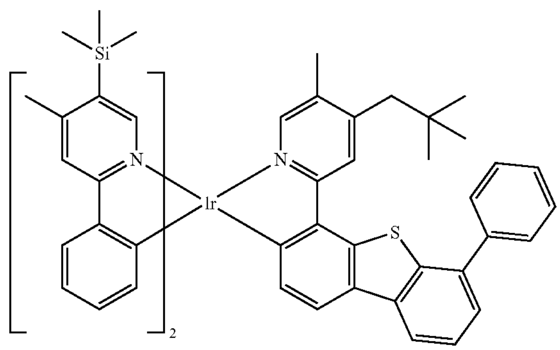
818
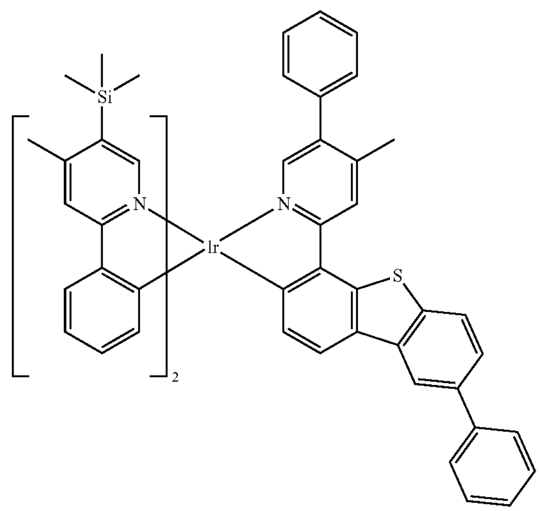
819
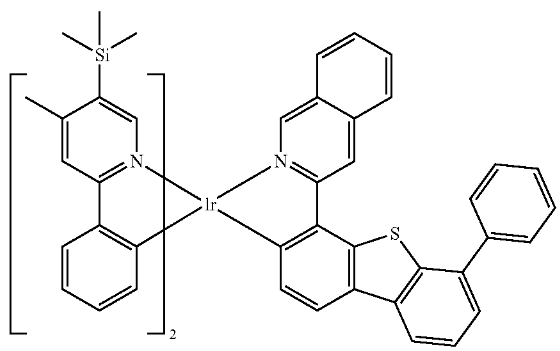
-continued
820
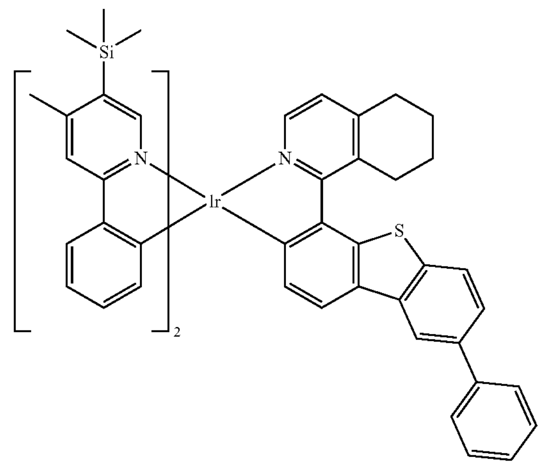
821
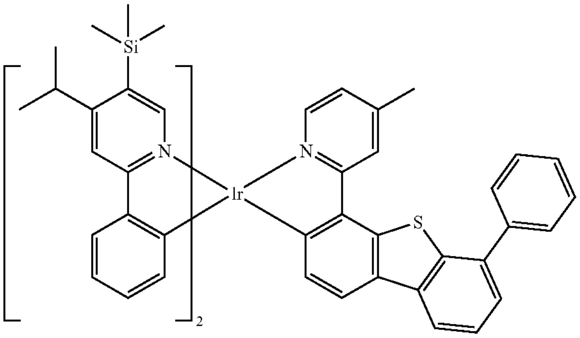
822
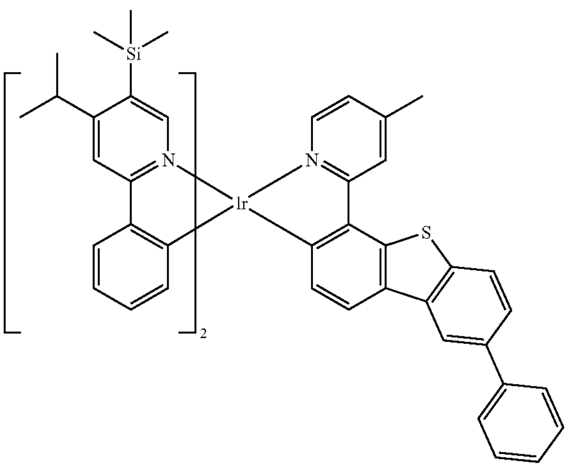

823
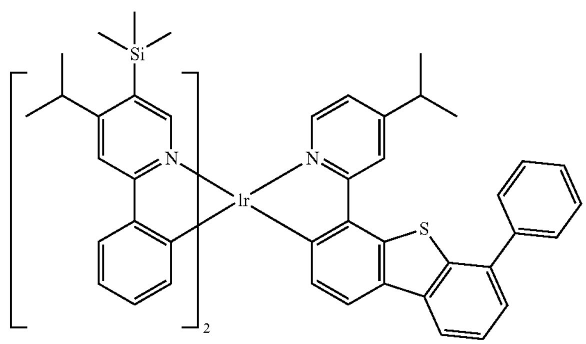
824
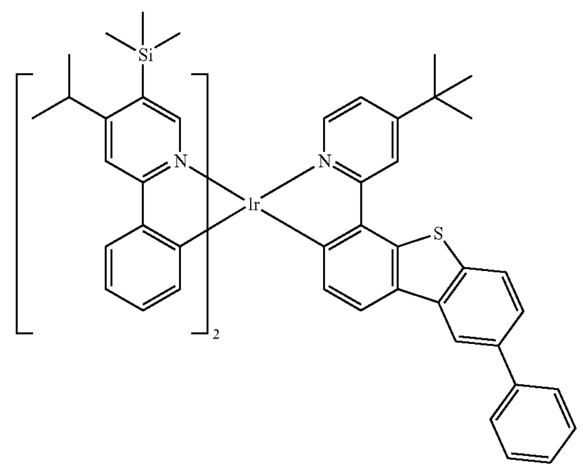
825
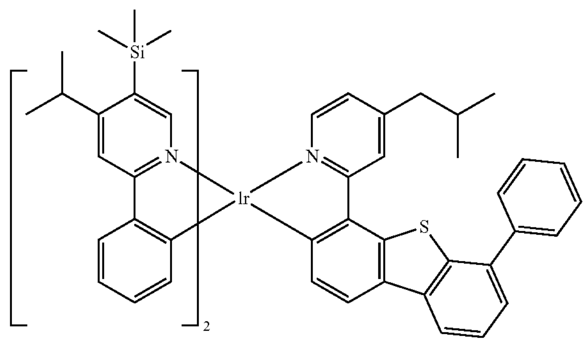
826
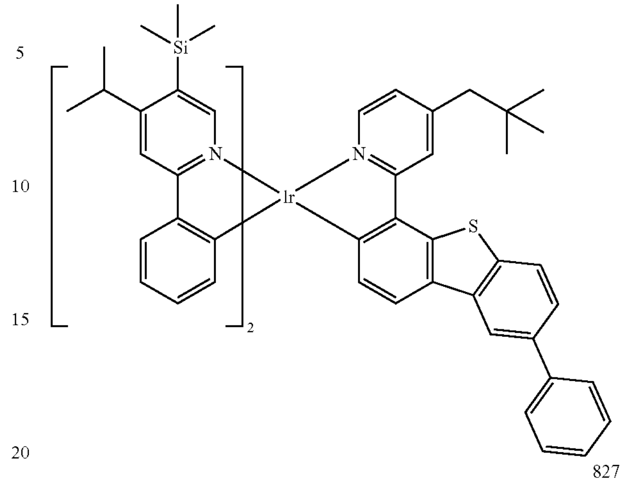
827
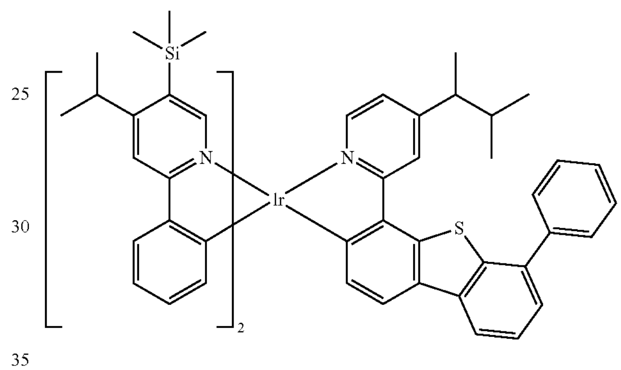
828
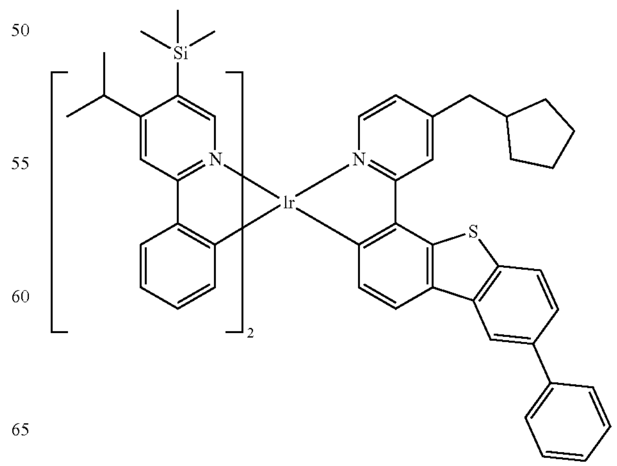

-continued
829
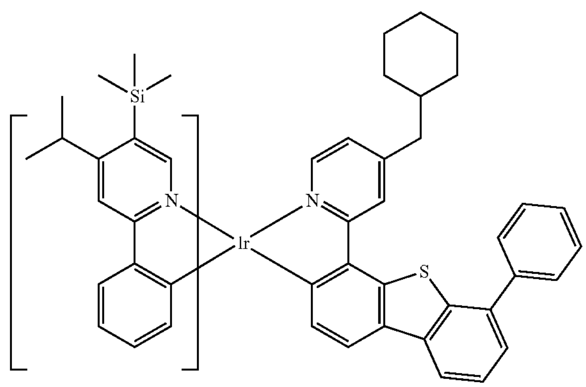
830
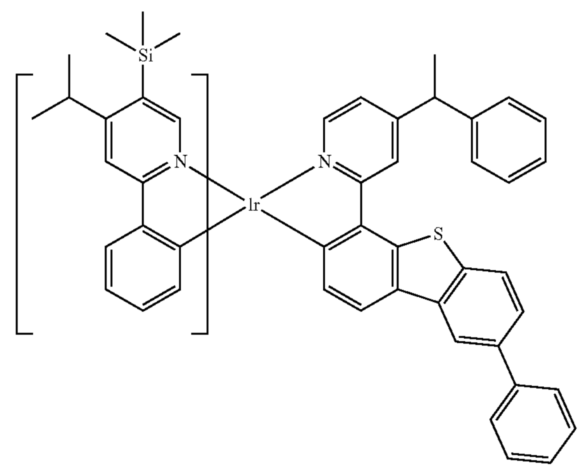
831
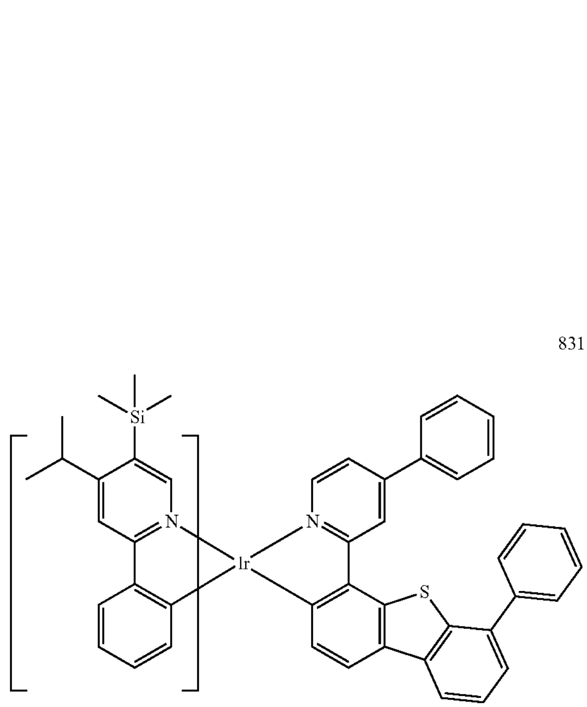
-continued
832
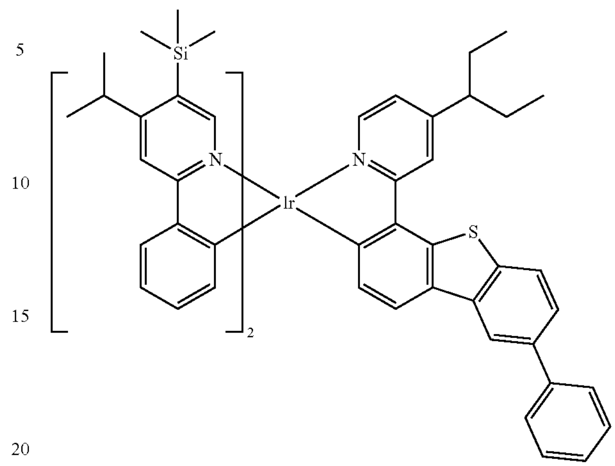
833
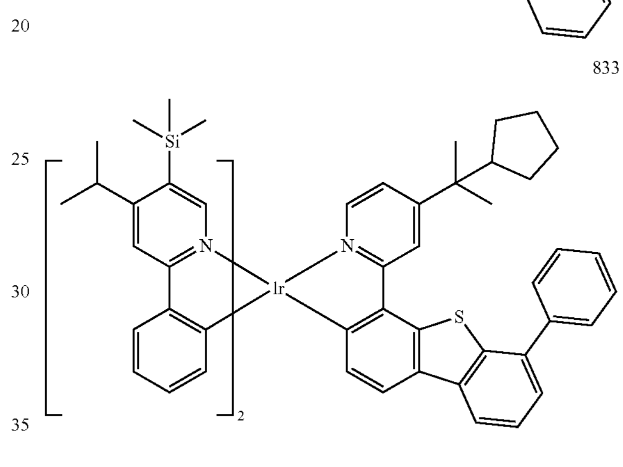
834
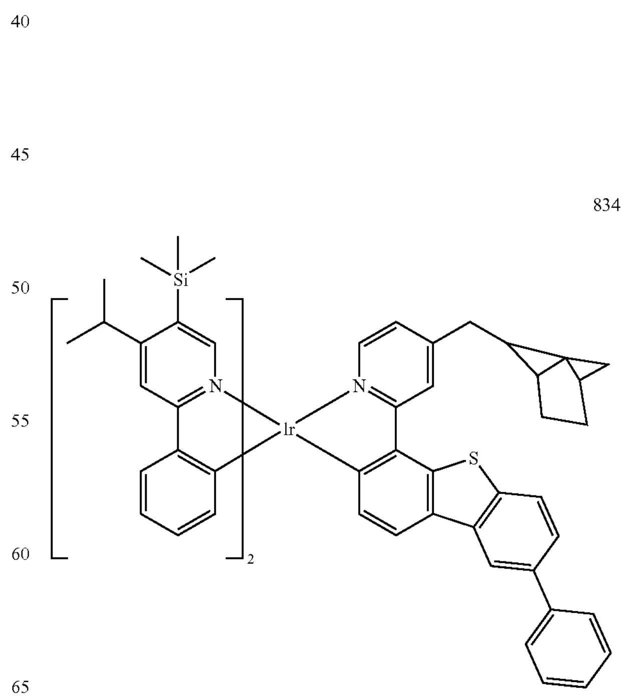
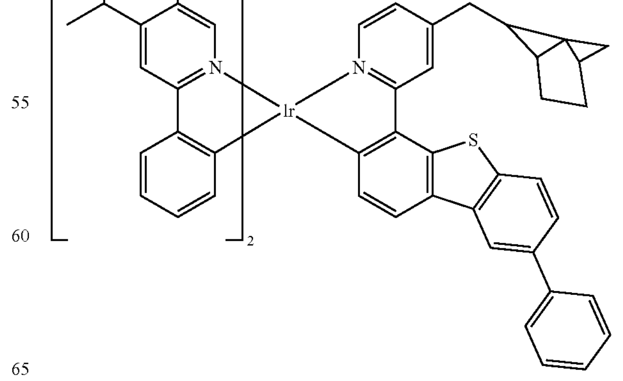

835
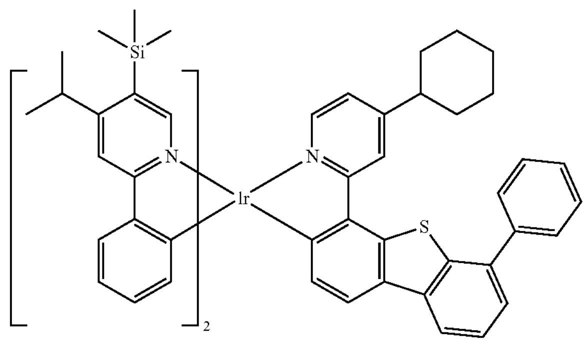
838
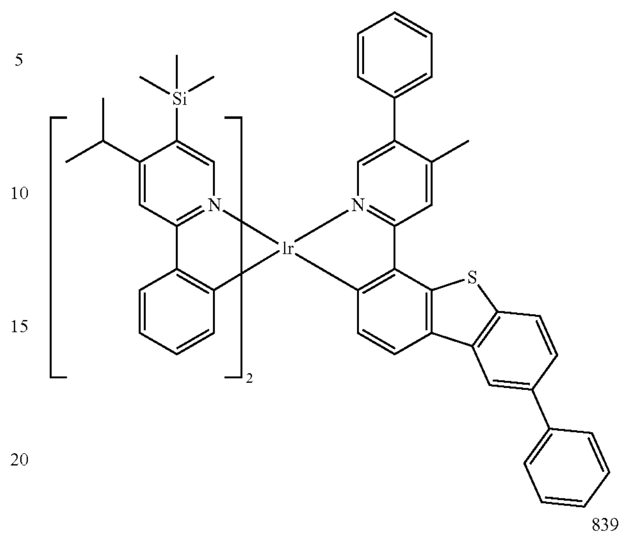
836
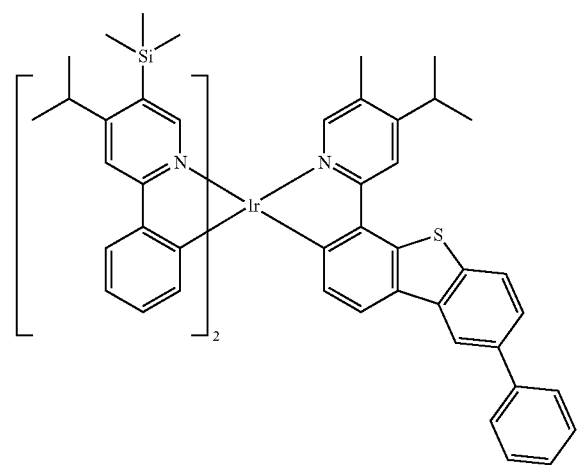
839
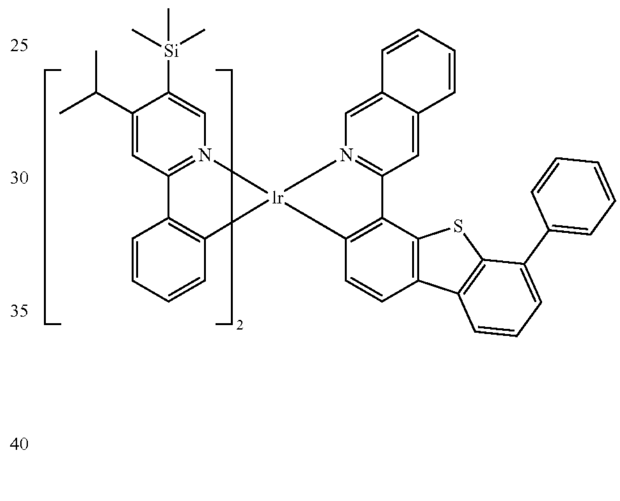
837
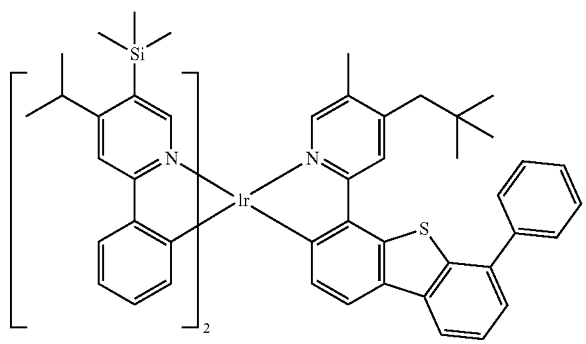
840
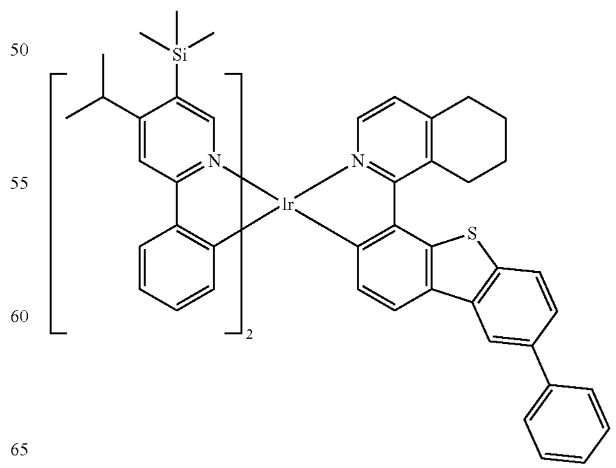

-continued
841
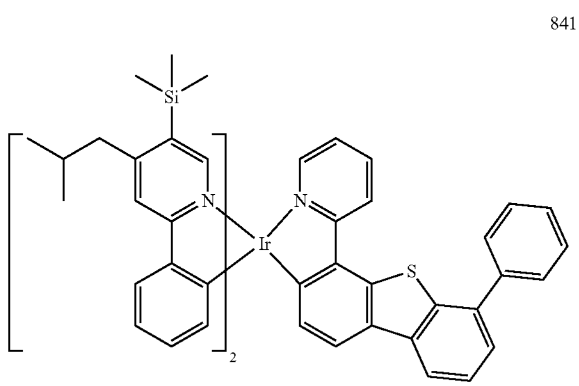
842
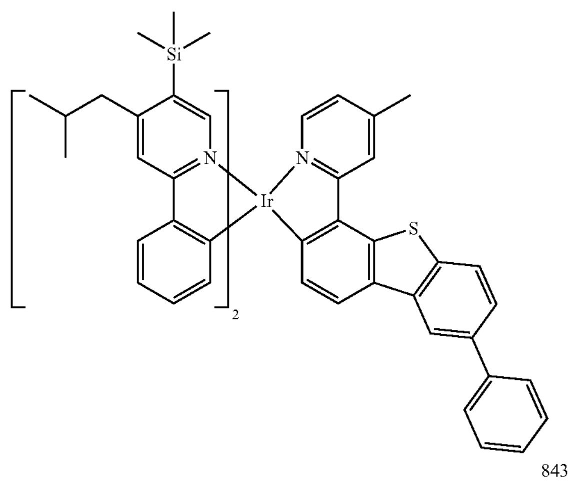
843
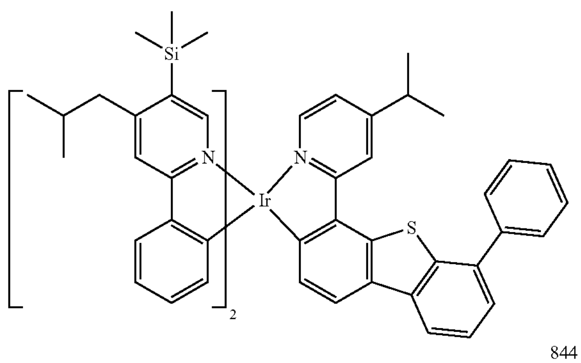
844
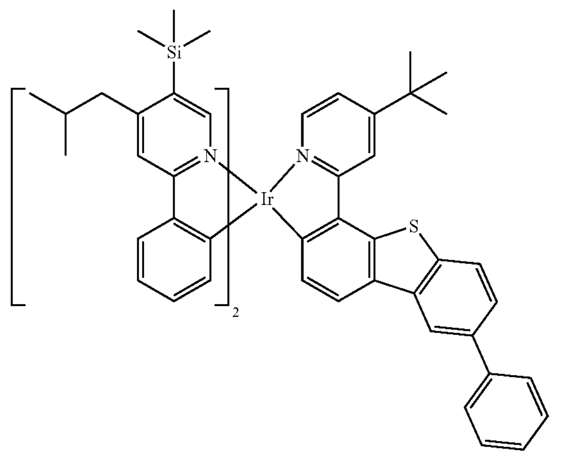
845
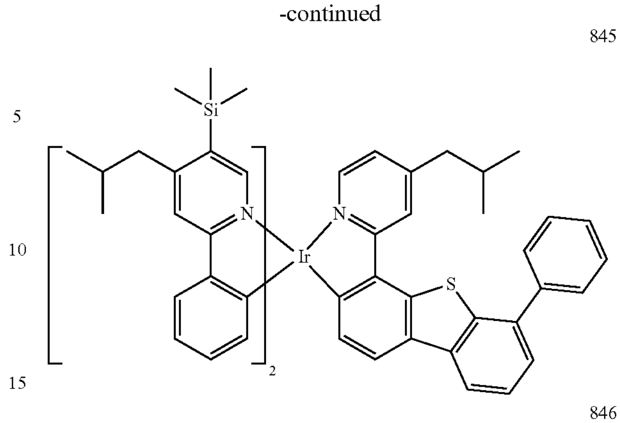
846
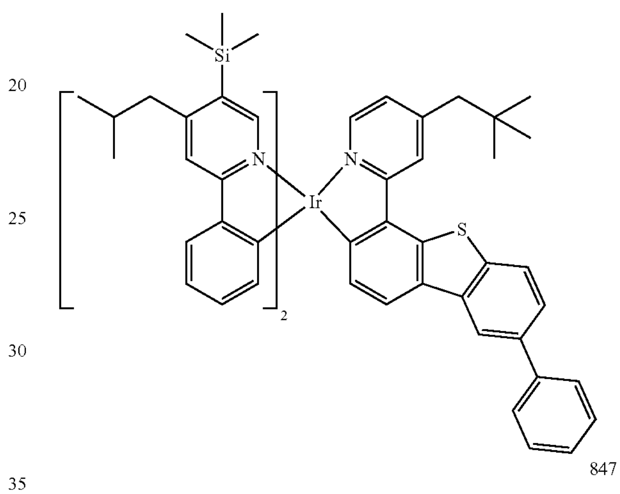
847
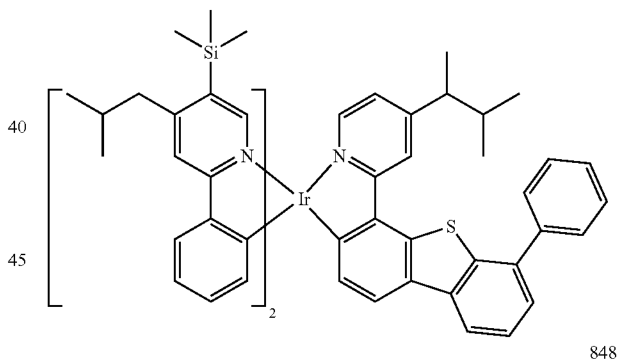
848
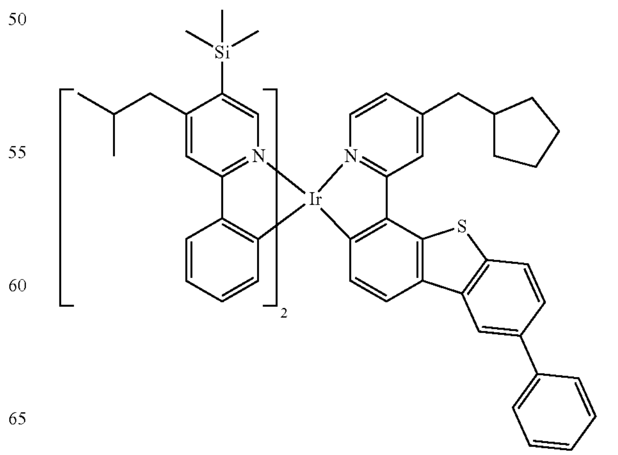

849
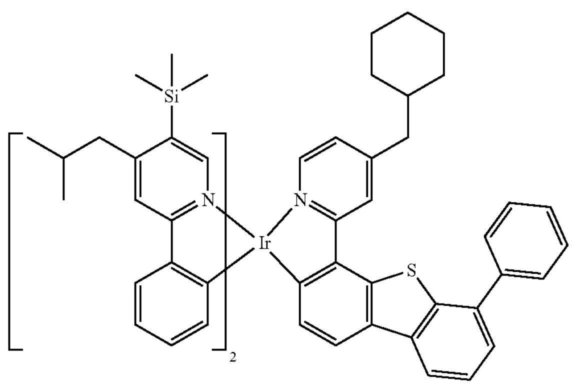
850
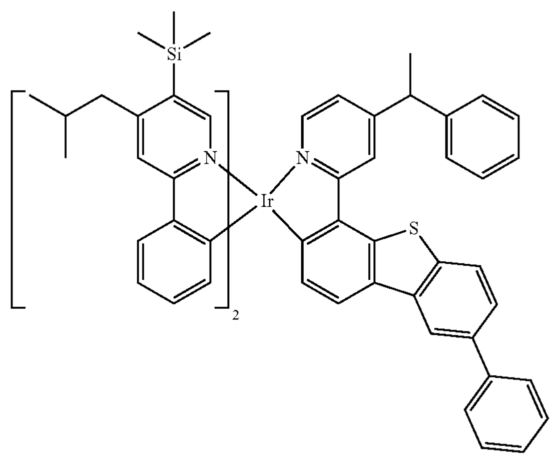
851
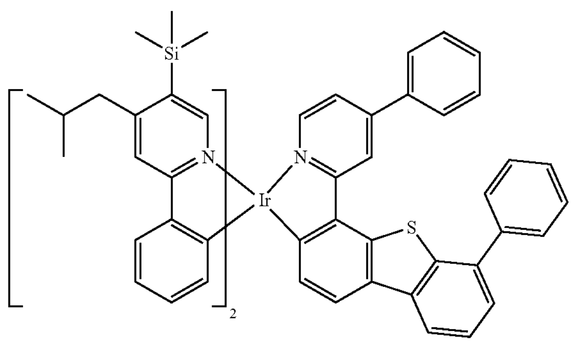
852
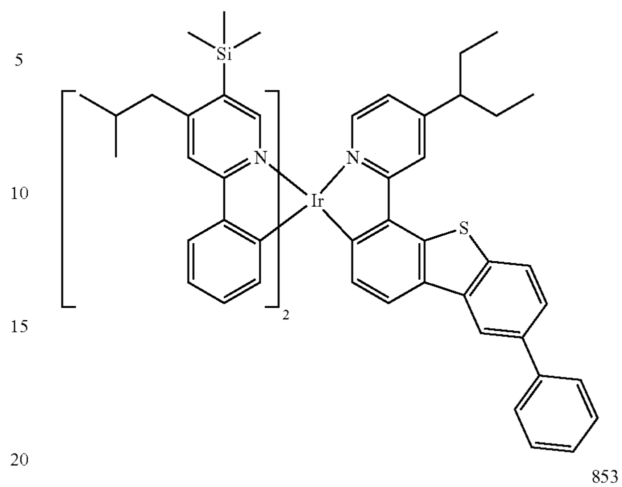
853
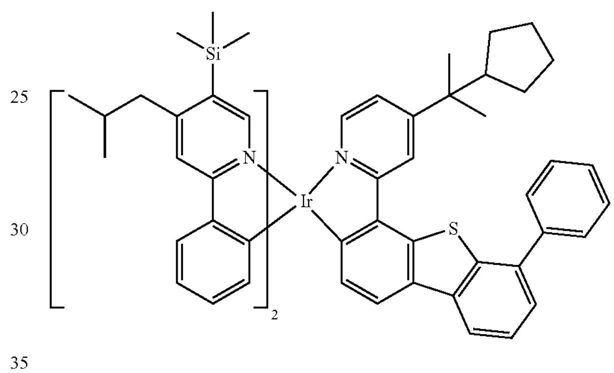
854
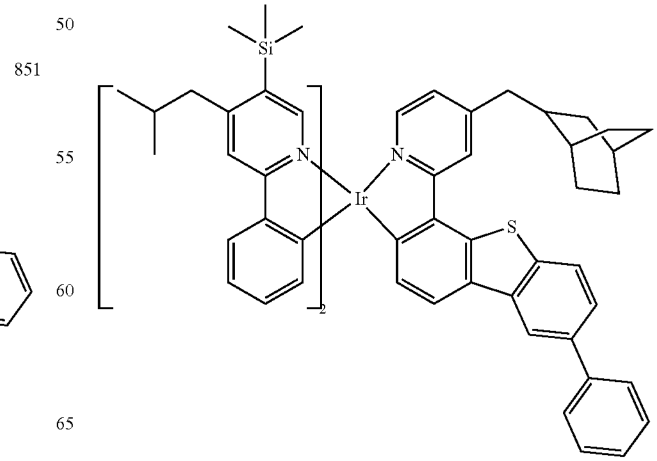

-continued
855
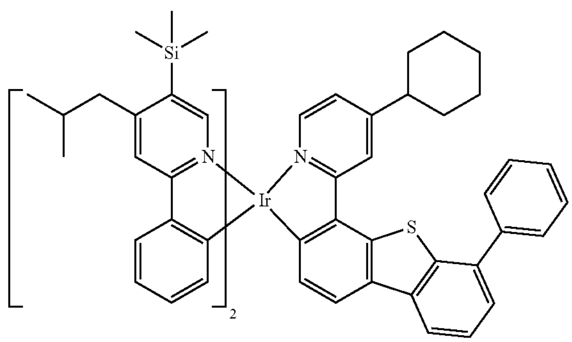
856
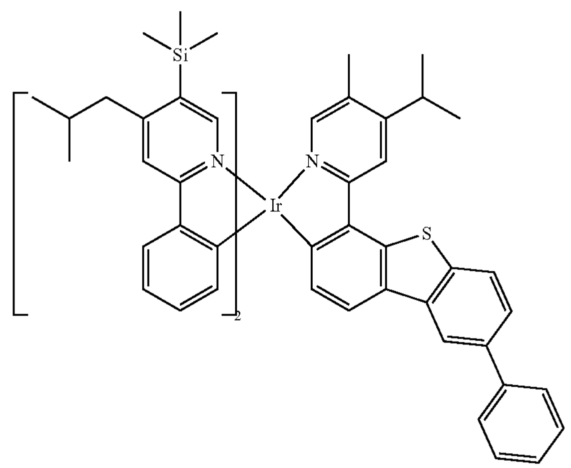
857
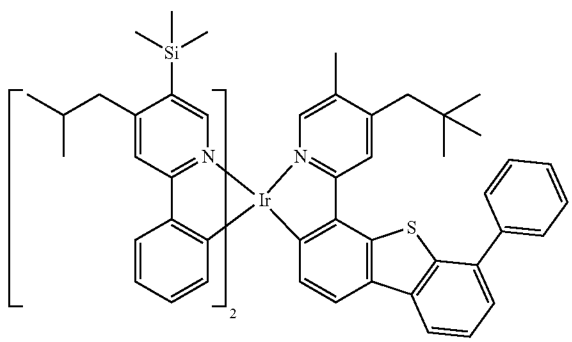
-continued
858
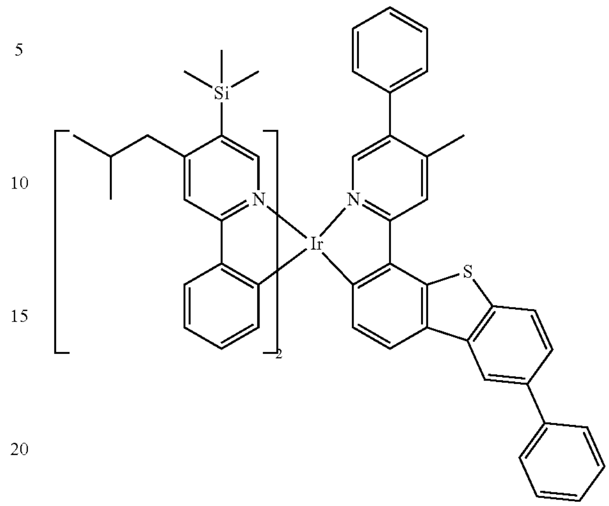
859
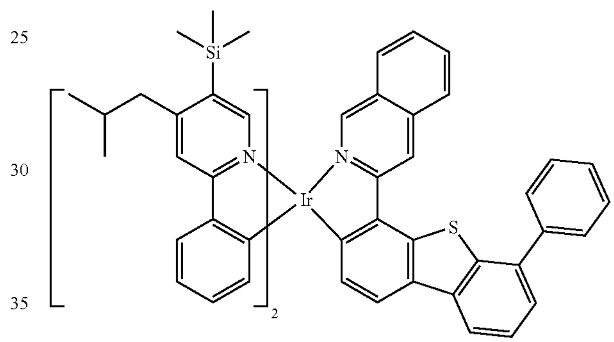
860
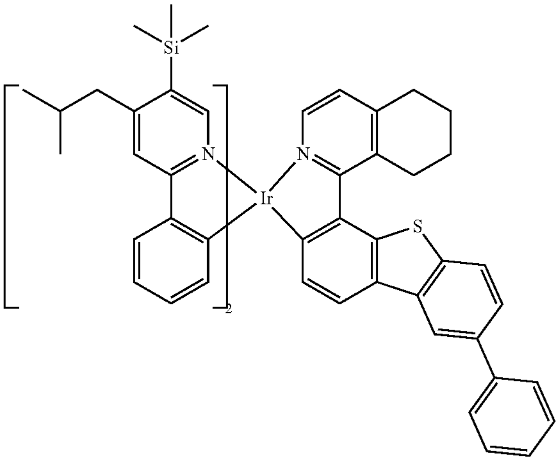

861
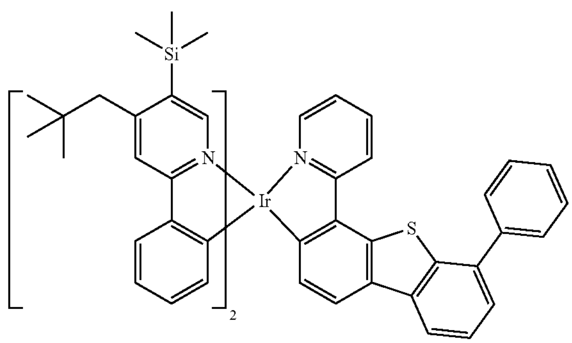
862
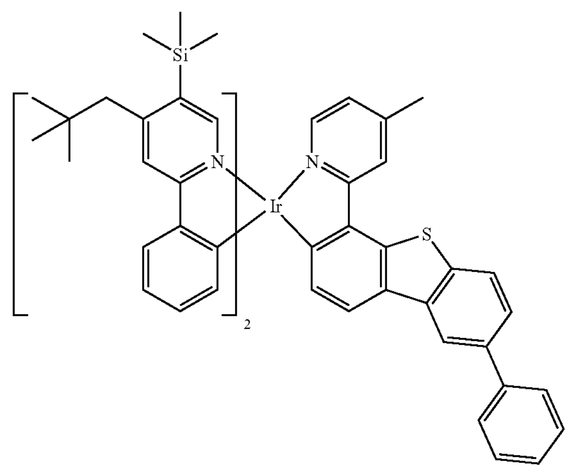
863
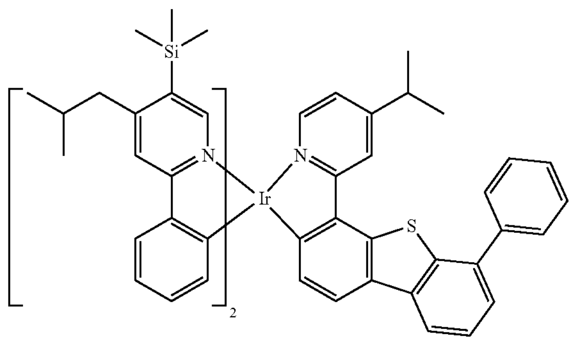
864
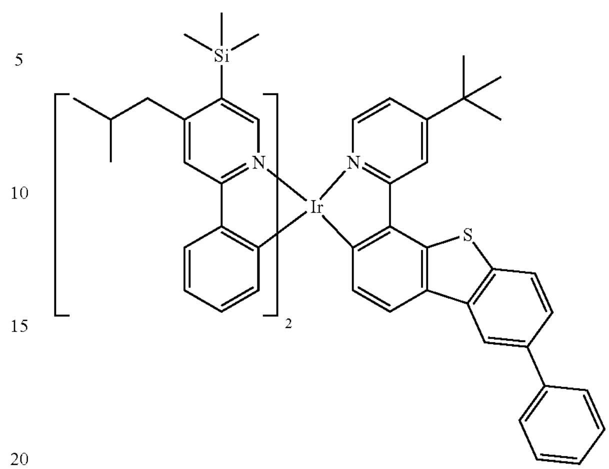
865
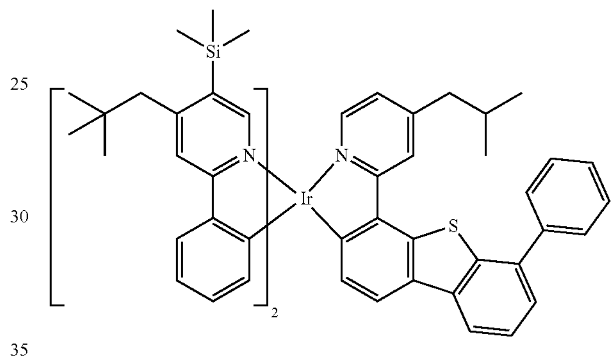
866
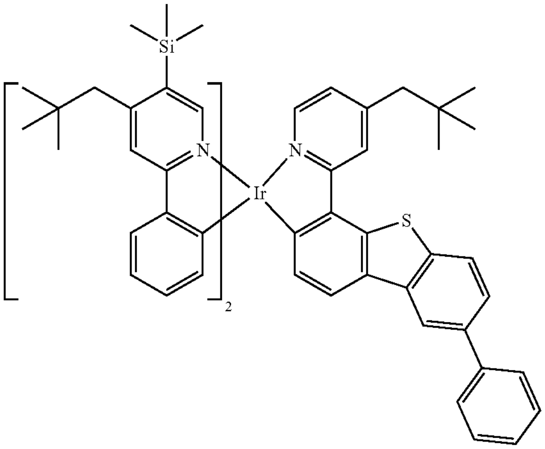

-continued
867
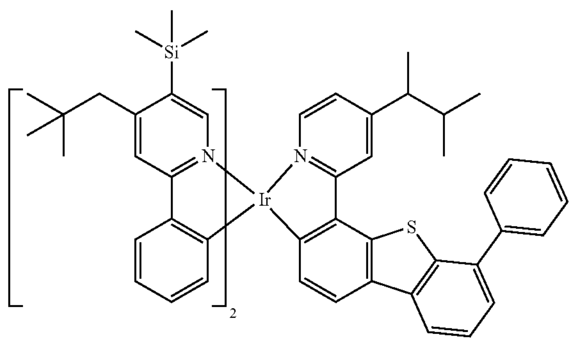
868
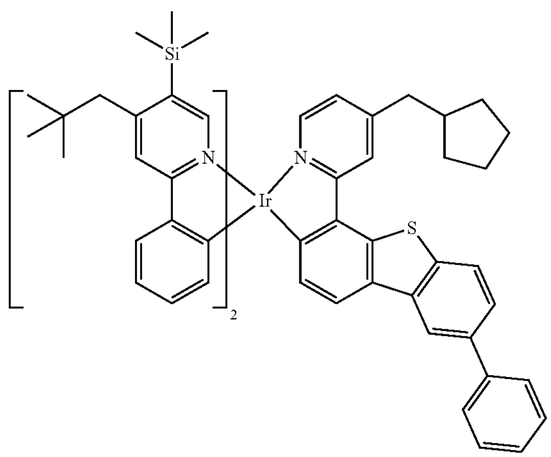
869
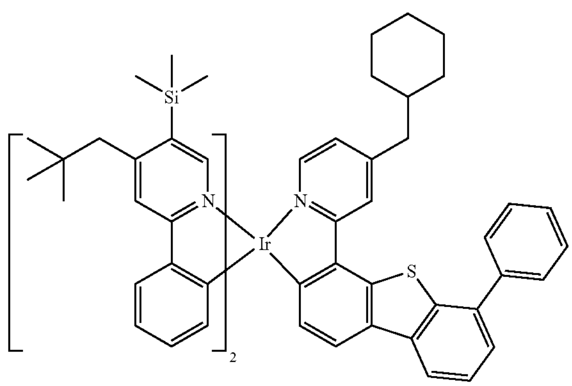
-continued
870
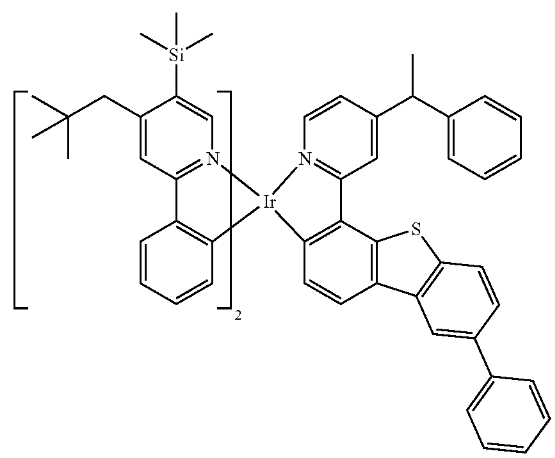
871
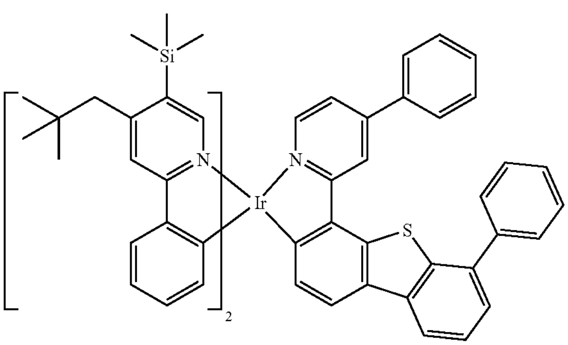
872
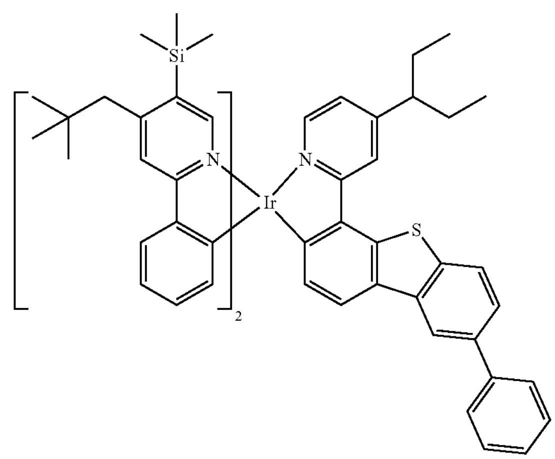

-continued
873
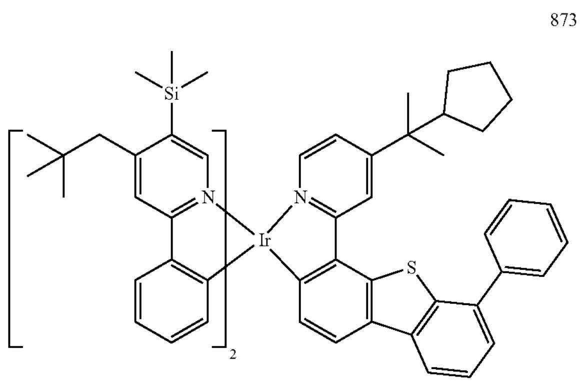
874
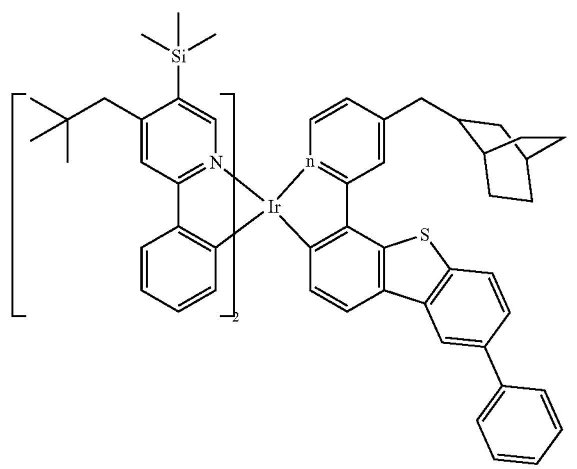
875
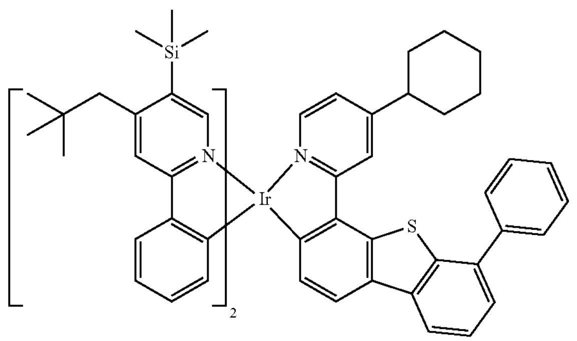
-continued
876
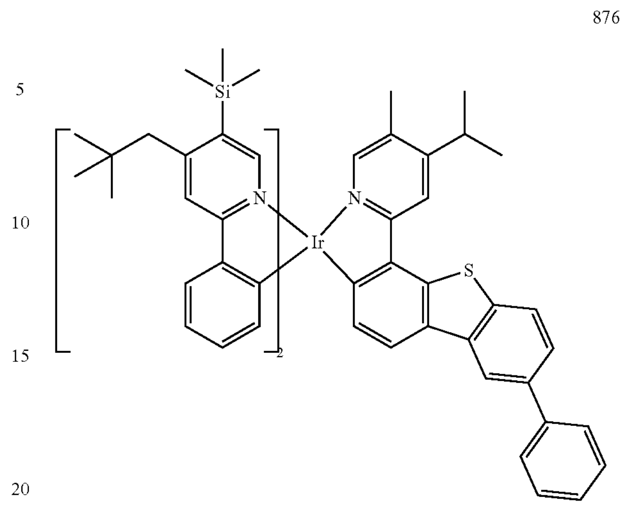
877
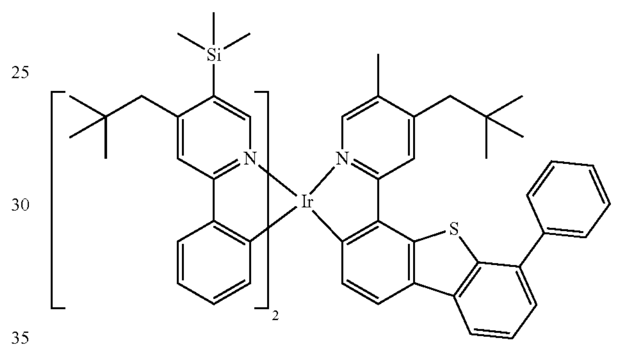
878
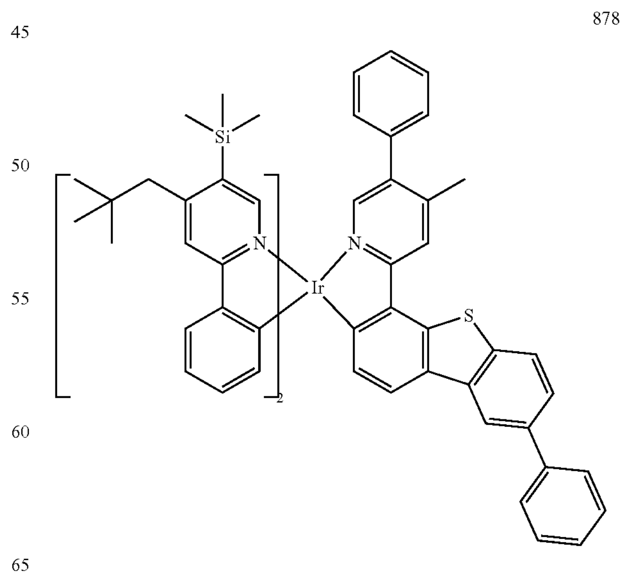

-continued
879
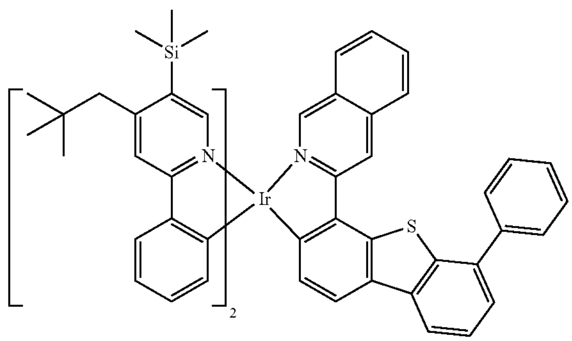
880
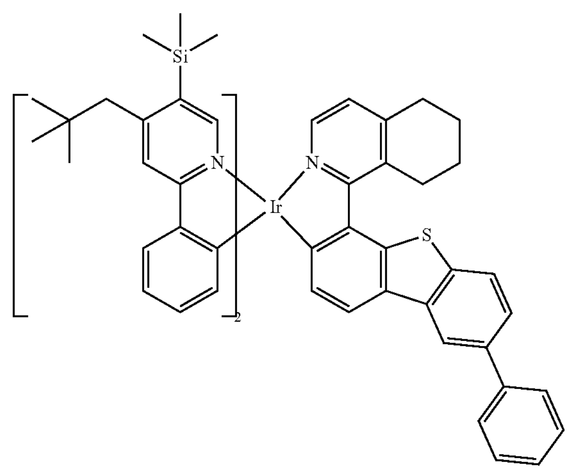
881
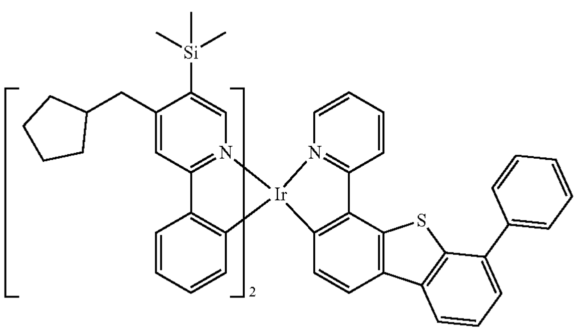
882
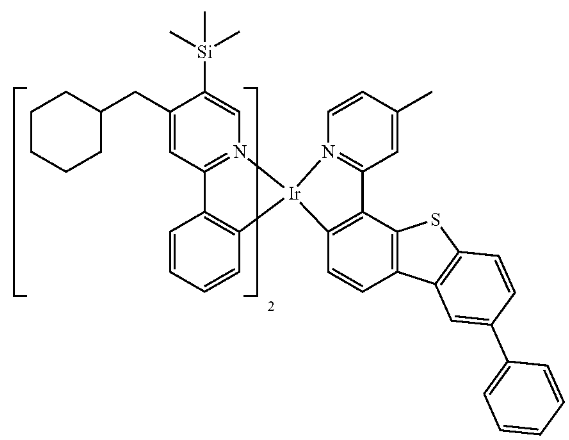
-continued
883
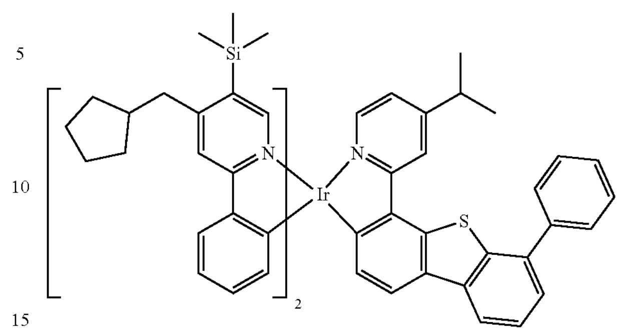
884
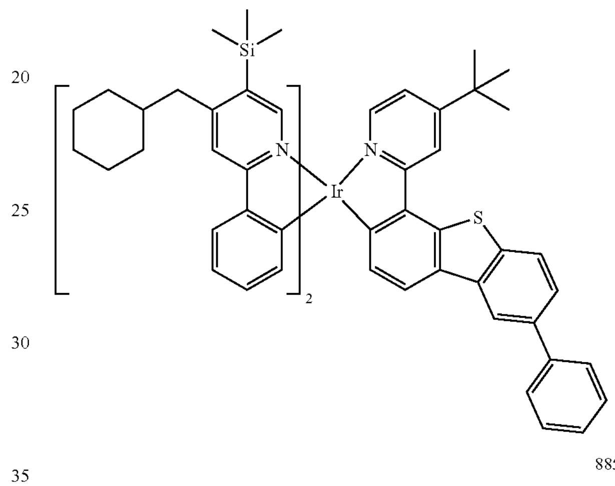
885
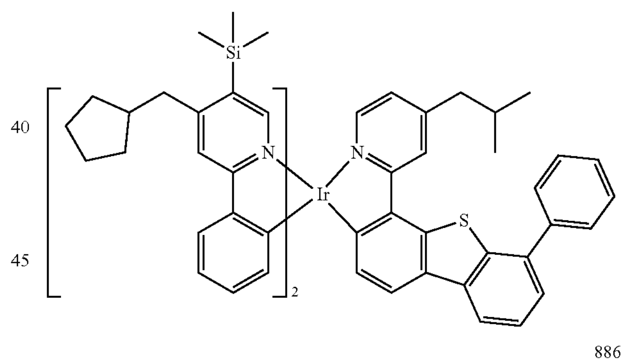
886
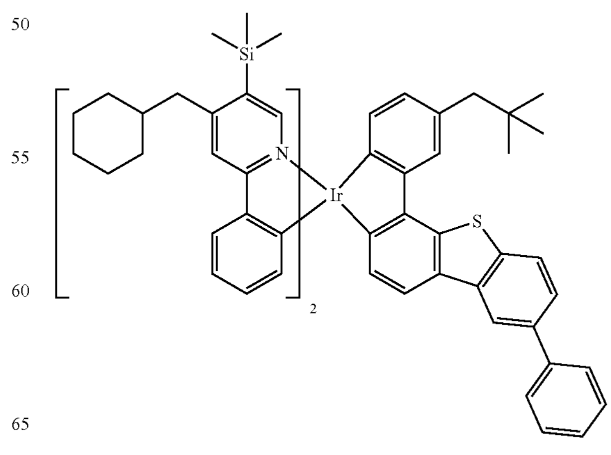

-continued
887
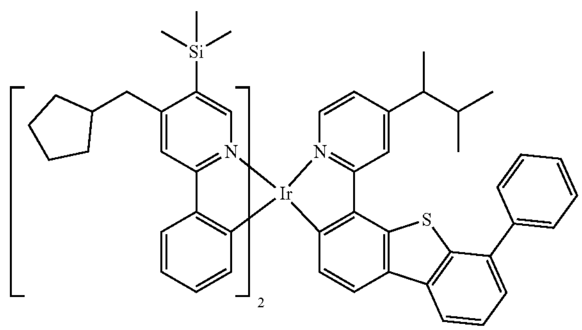
888
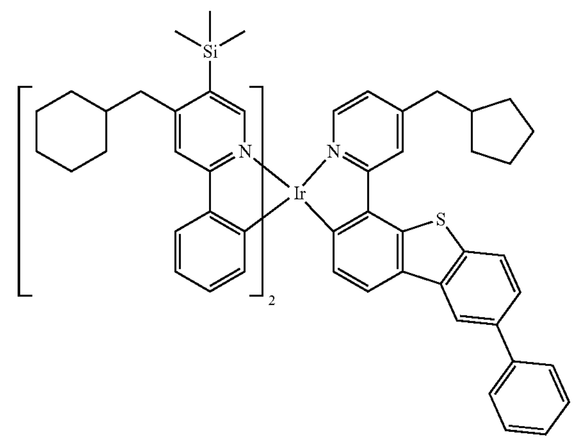
889
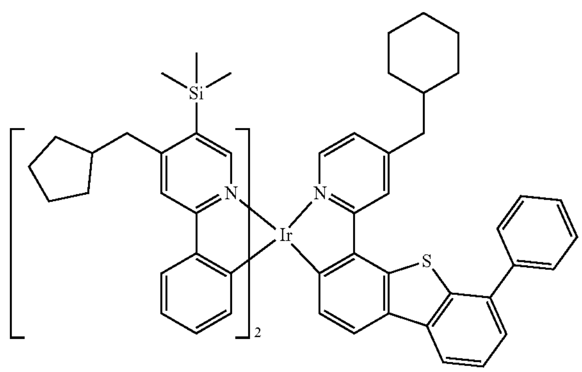
890
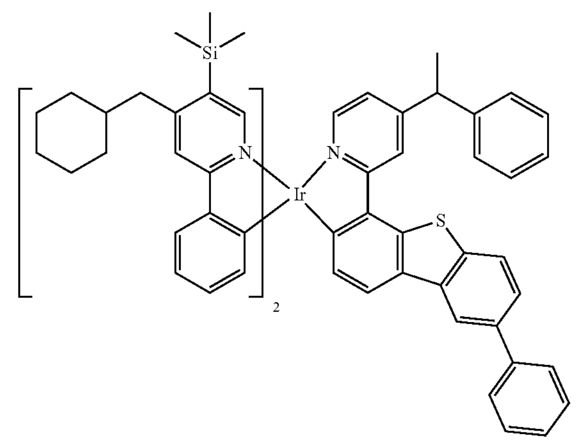
-continued
891
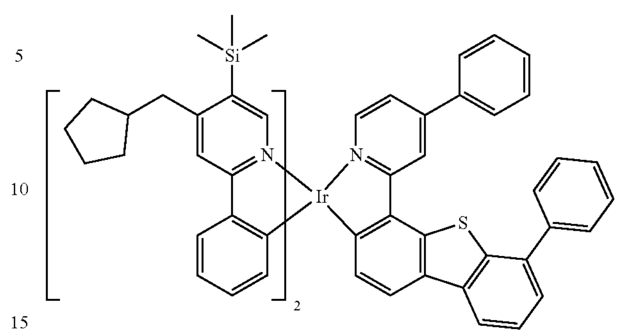
892
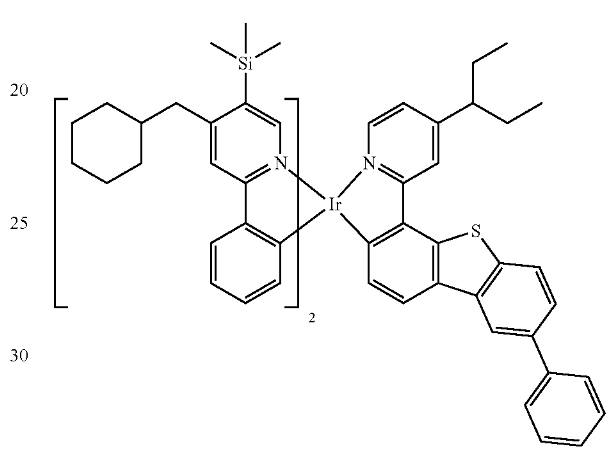
893
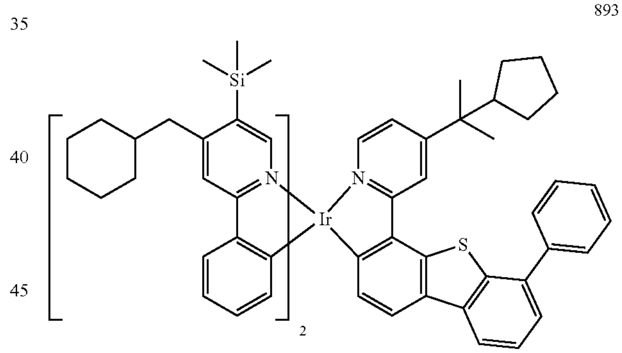
894
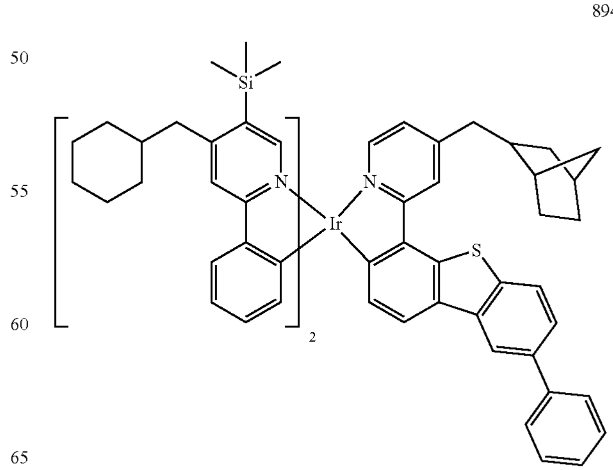

-continued
895
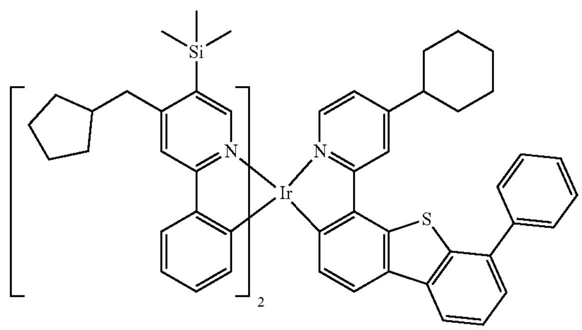
896
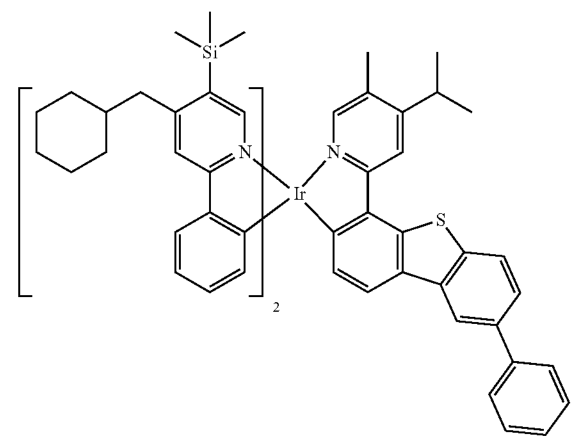
897
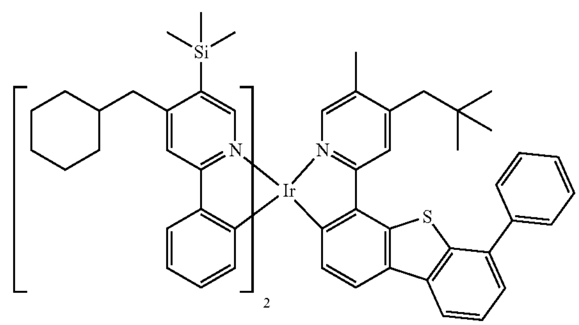
898
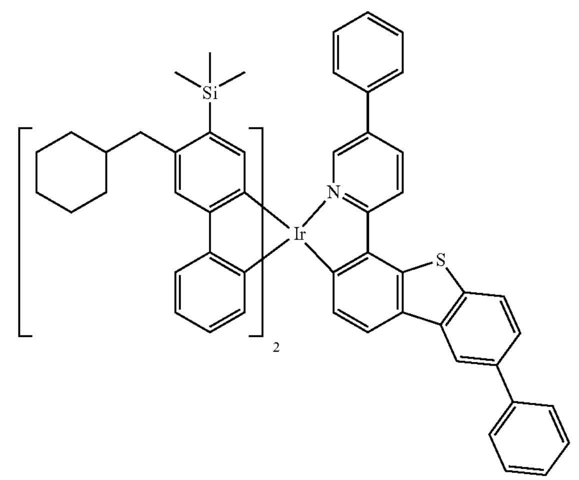
-continued
899
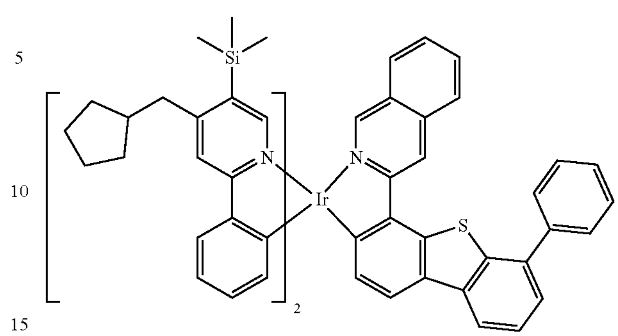
900
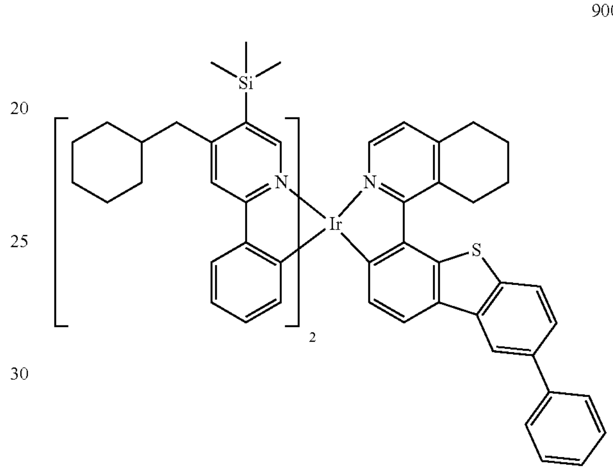
901
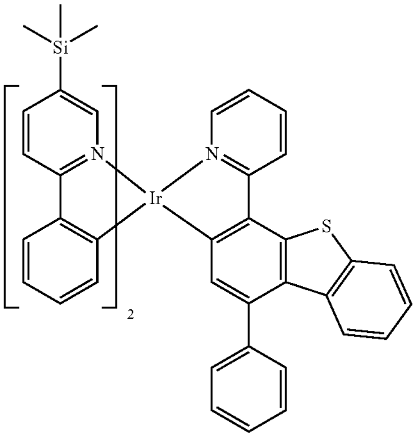

-continued
902
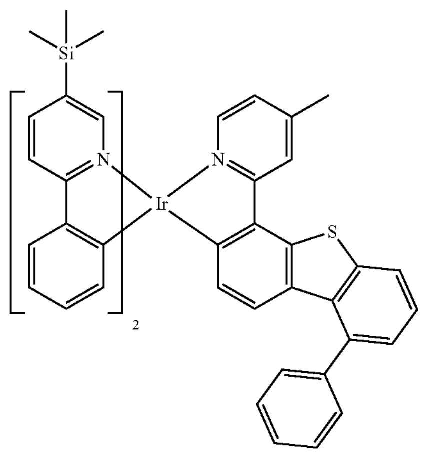
903
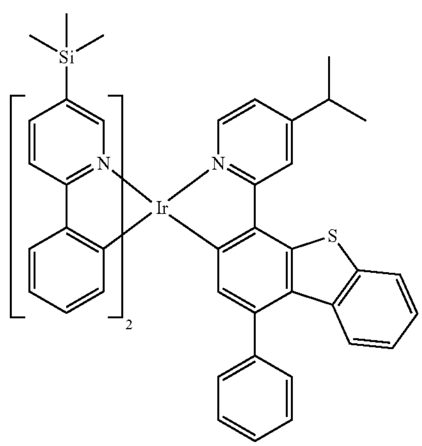
904
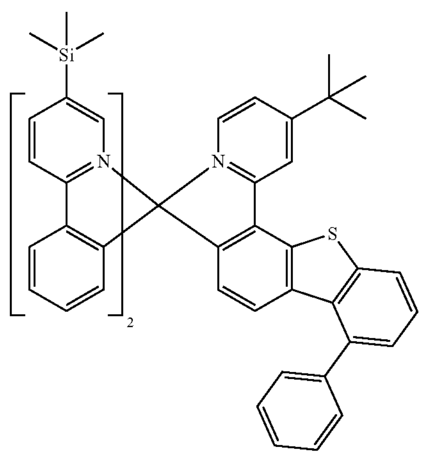
-continued
905
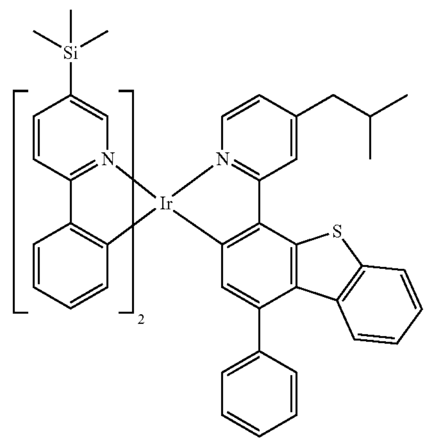
906
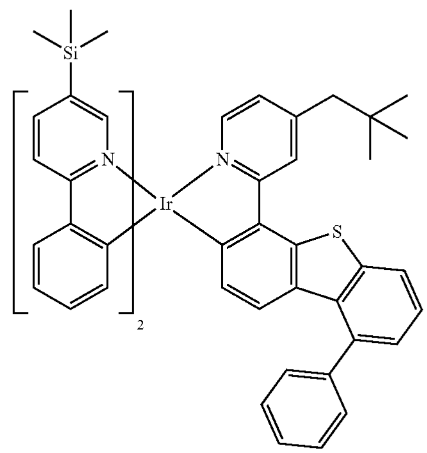
907
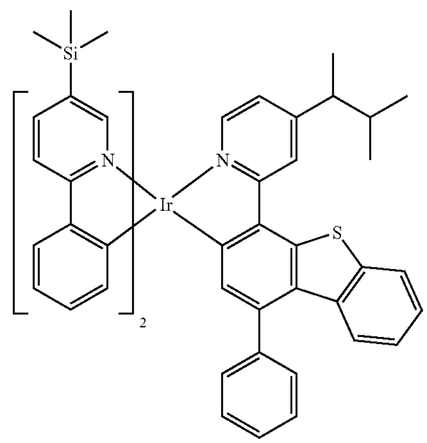

-continued
908
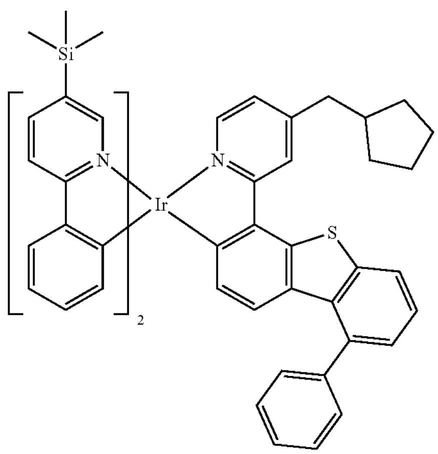
909
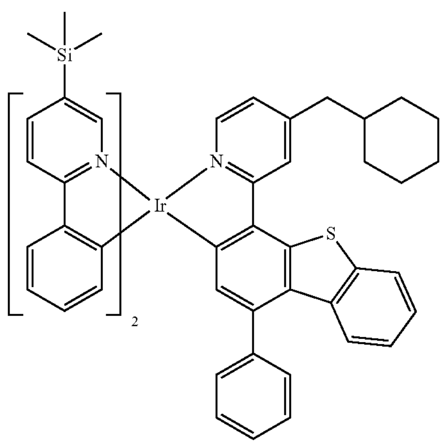
910
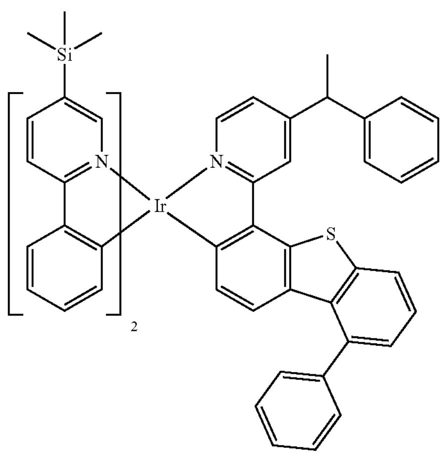
-continued
911
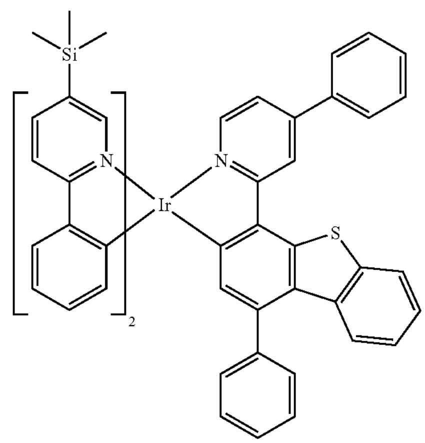
912
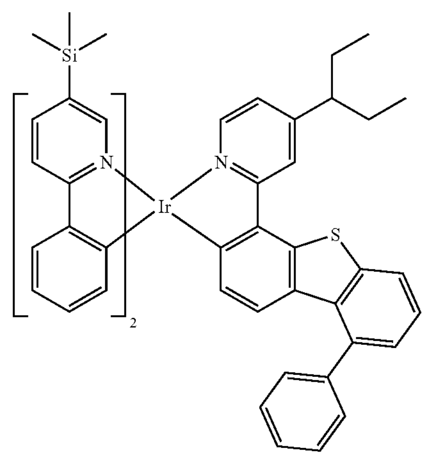
913
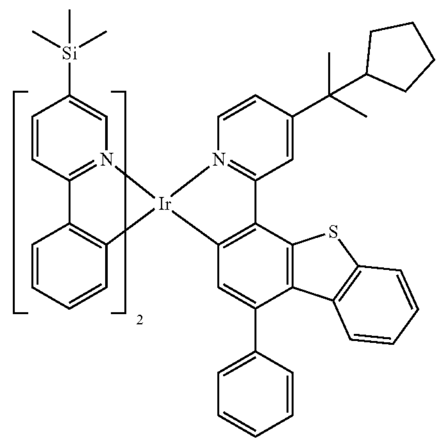

-continued
914
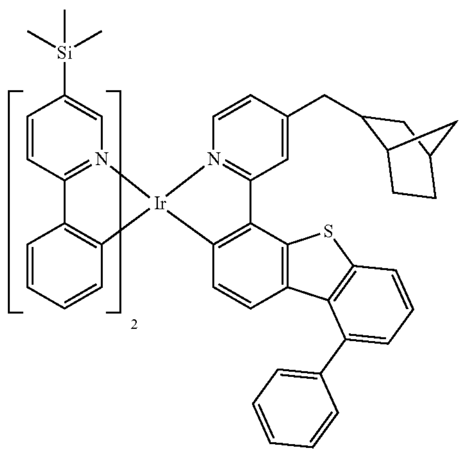
915
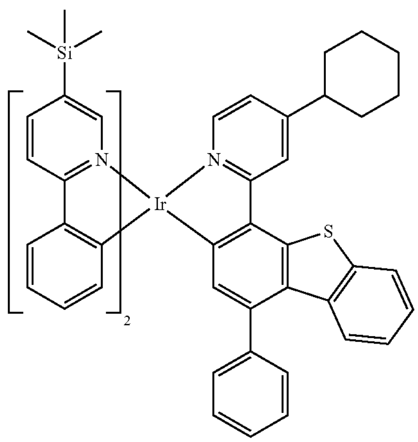
916
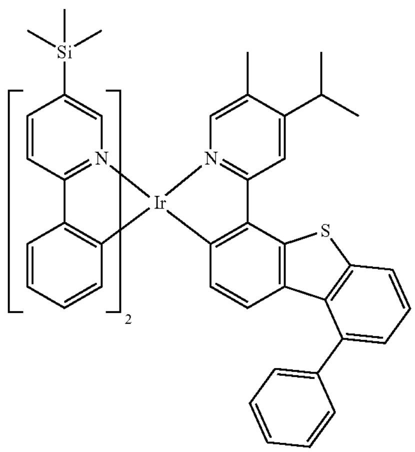
-continued
917
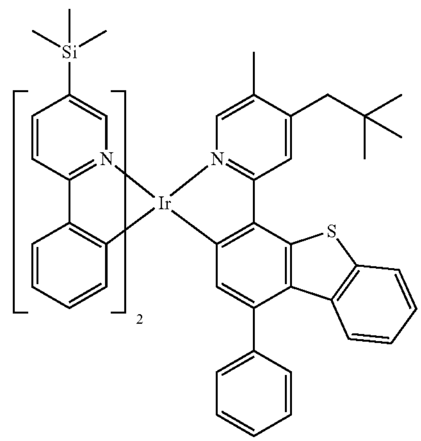
918
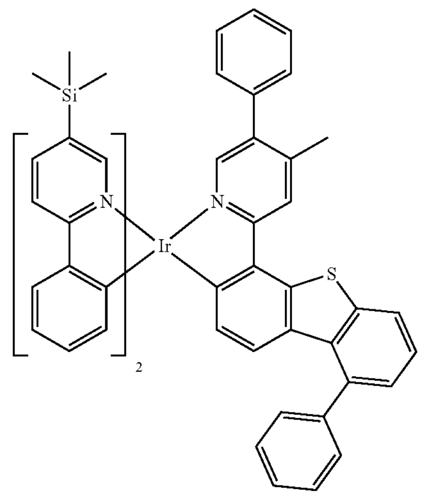
919
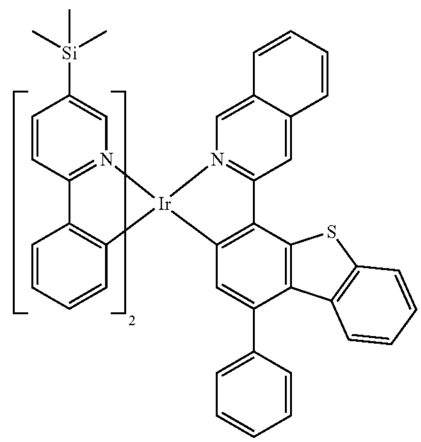

-continued
920
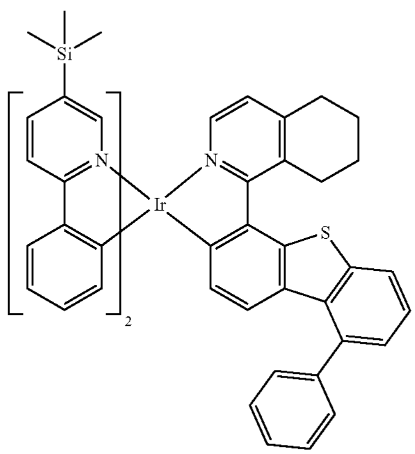
921
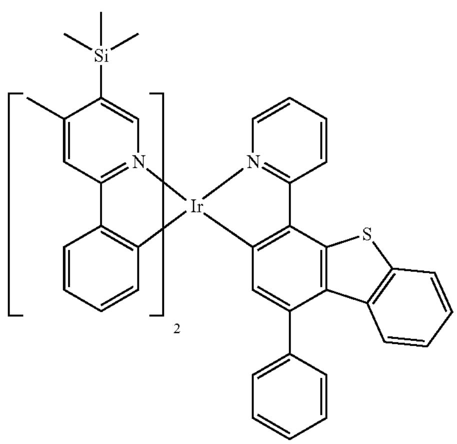
922
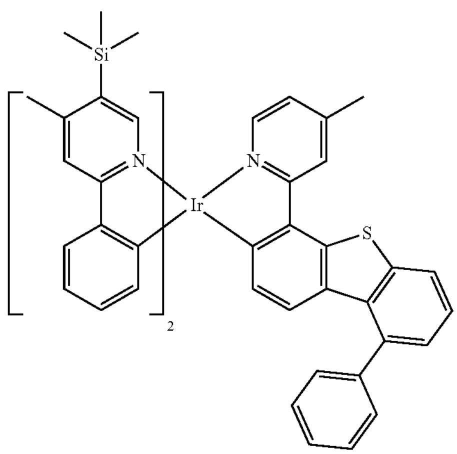
-continued
923
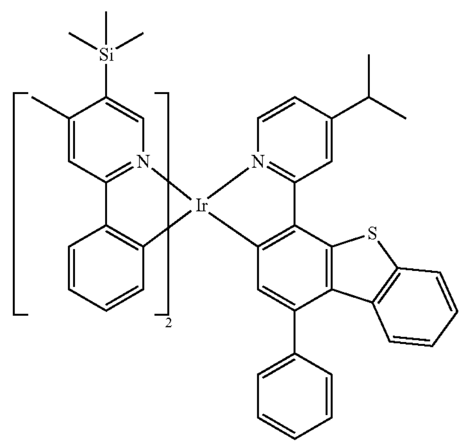
924
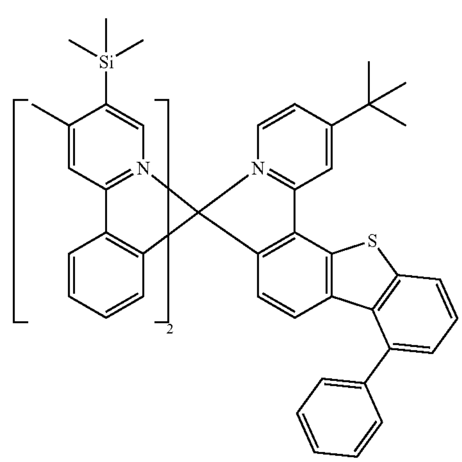
925
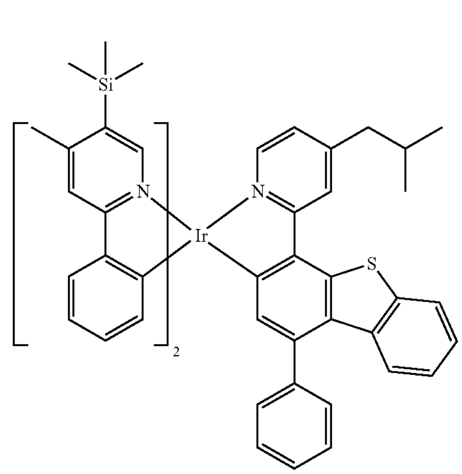

-continued
926
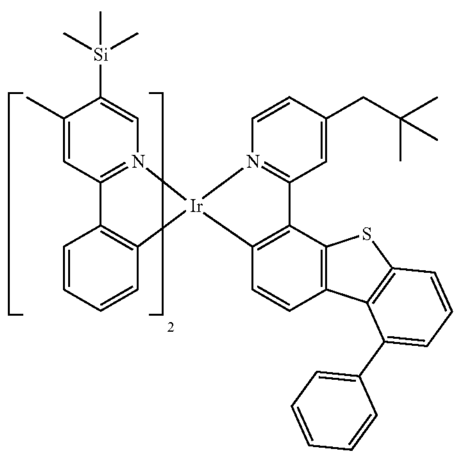
927
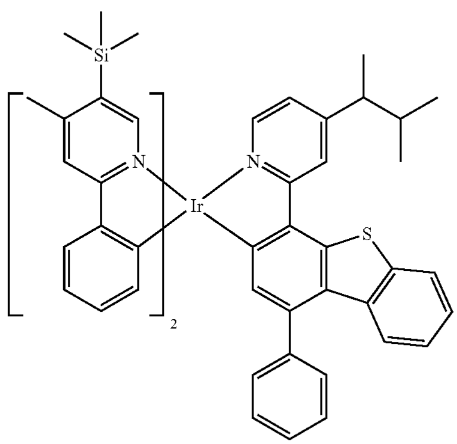
928
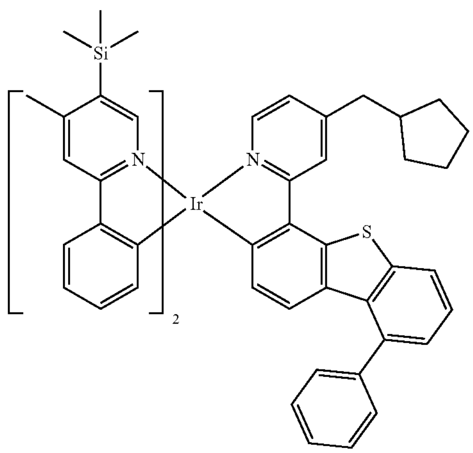
-continued
929
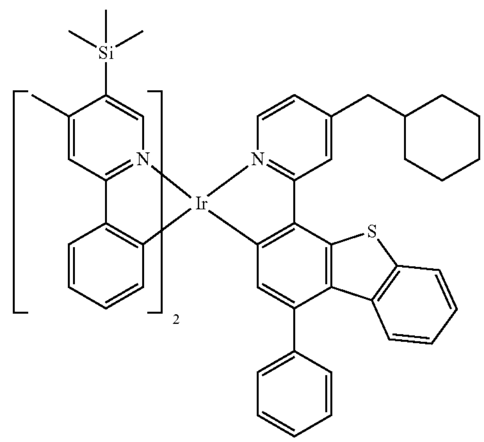
930
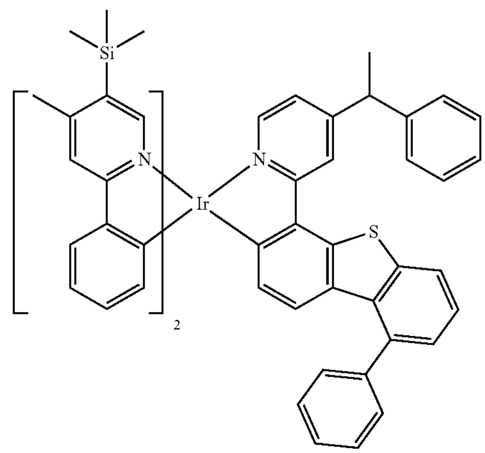
931
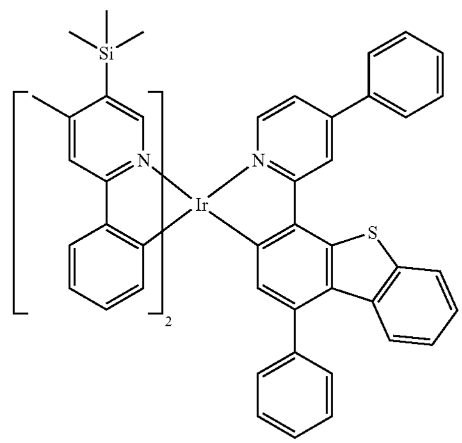

-continued
932
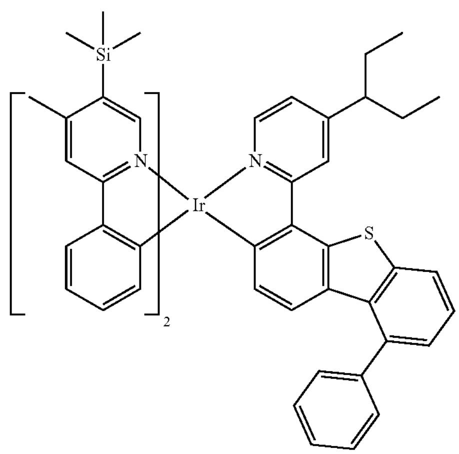
933
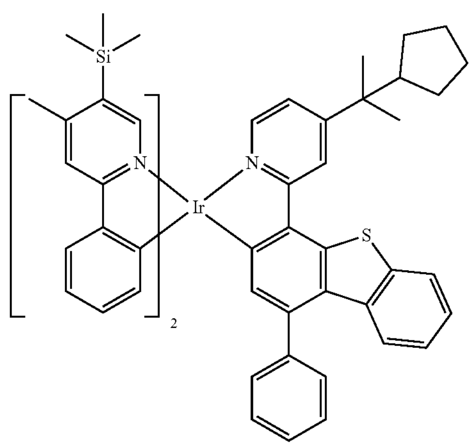
934
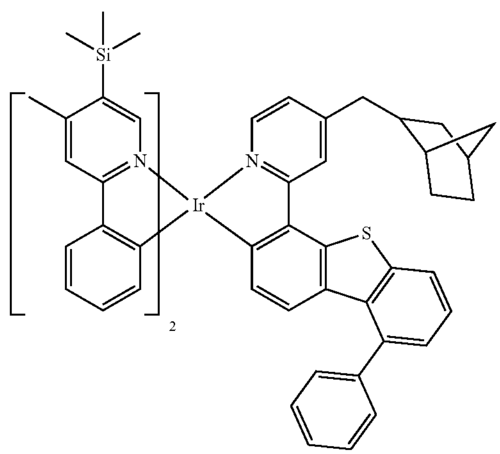
-continued
935
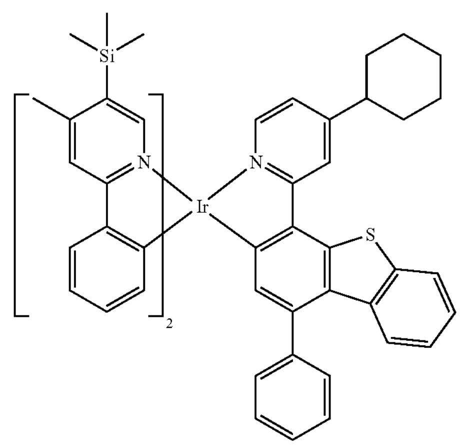
936
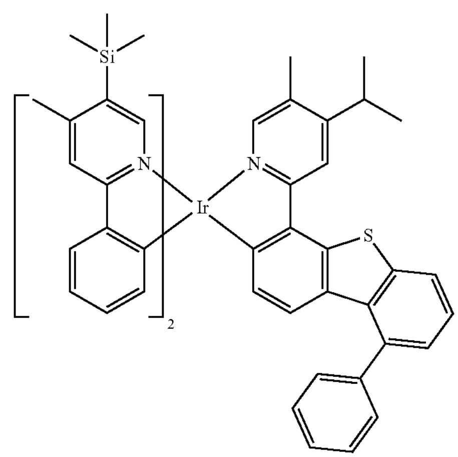
937
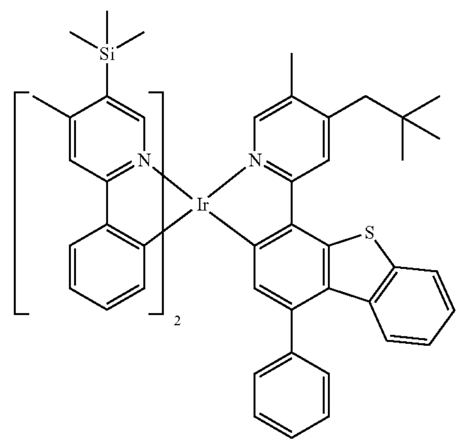

-continued
938
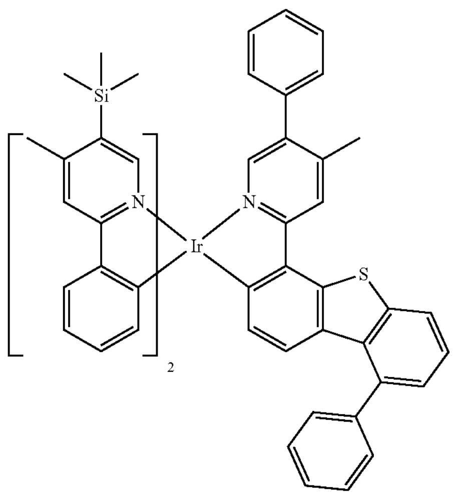
939
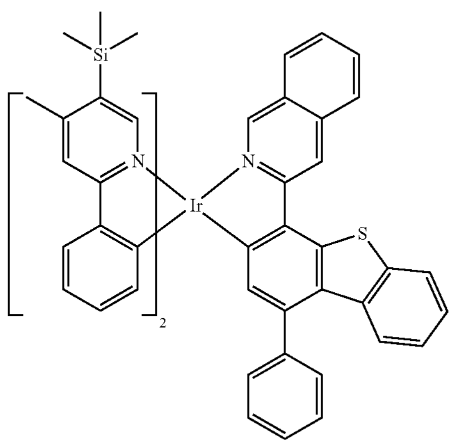
940
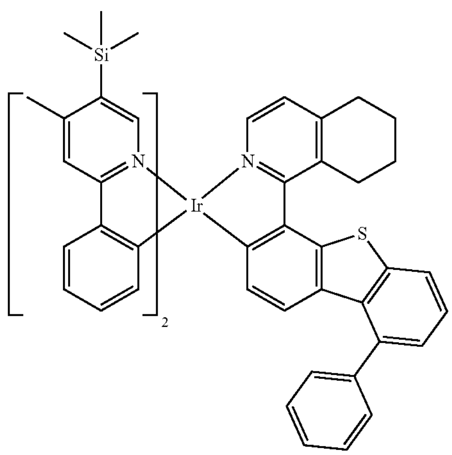
-continued
941
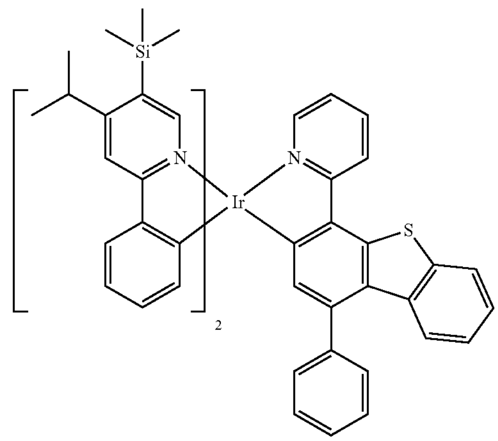
942
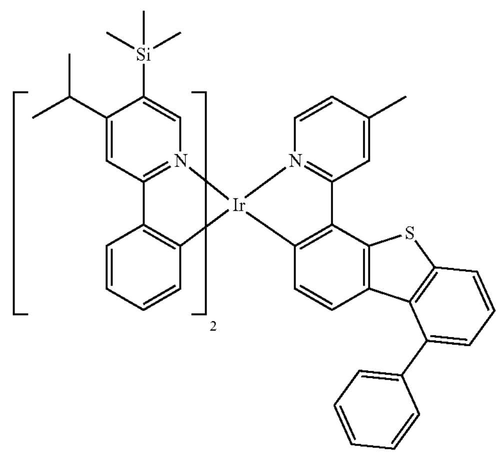
943
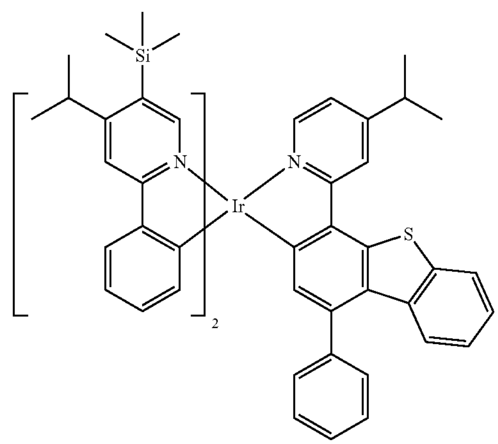

944
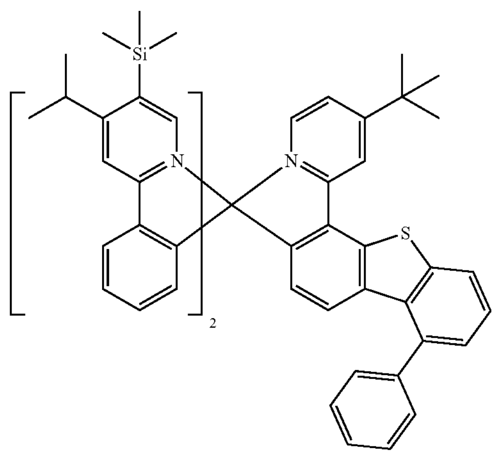
945
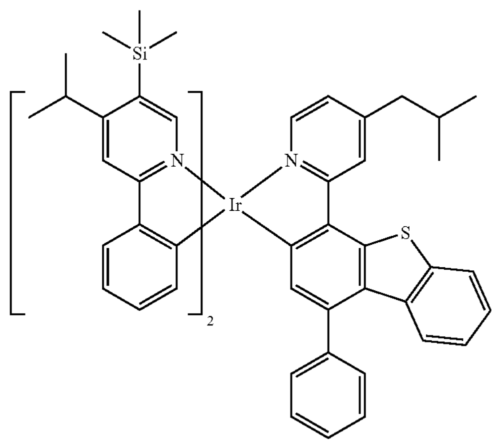
946
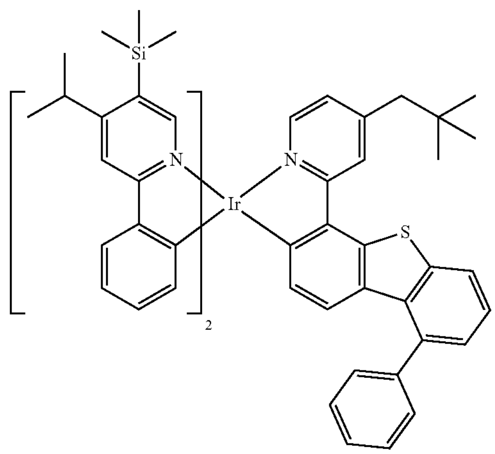
947
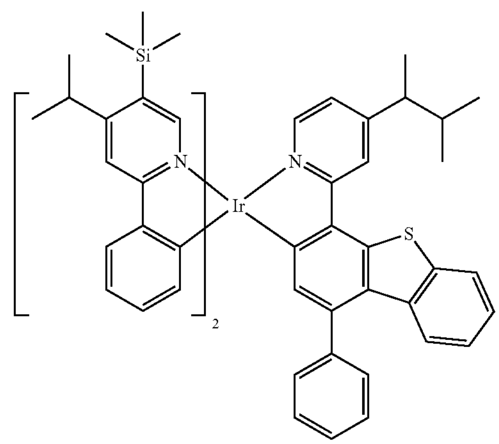
948
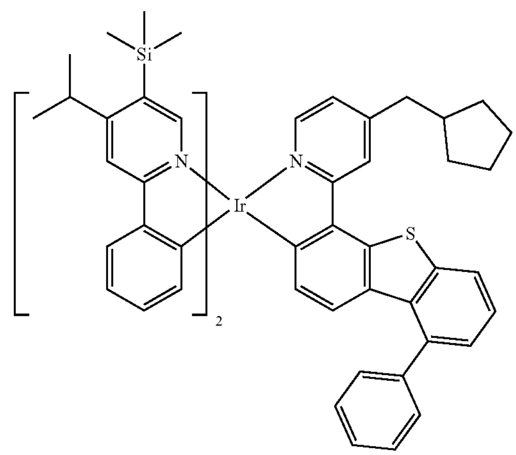
949
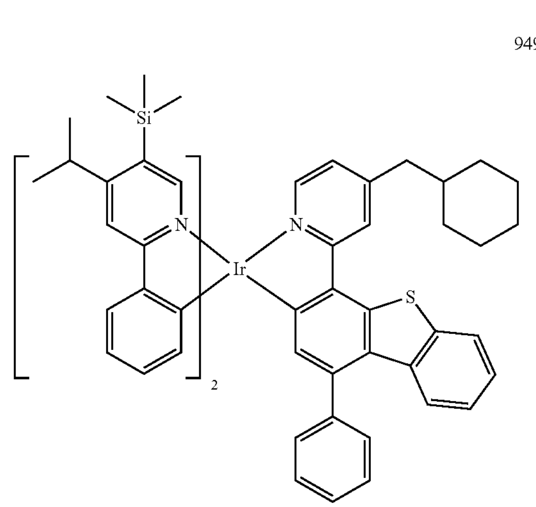

-continued
950
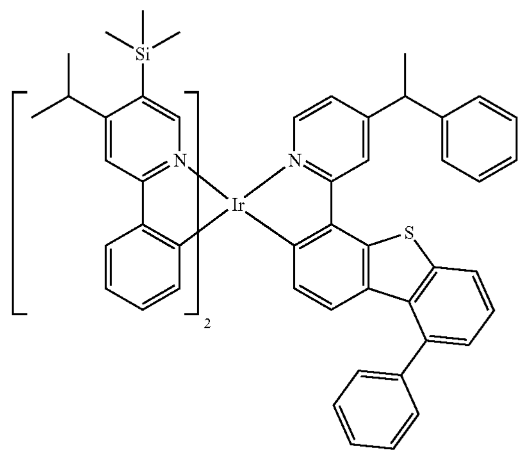
951
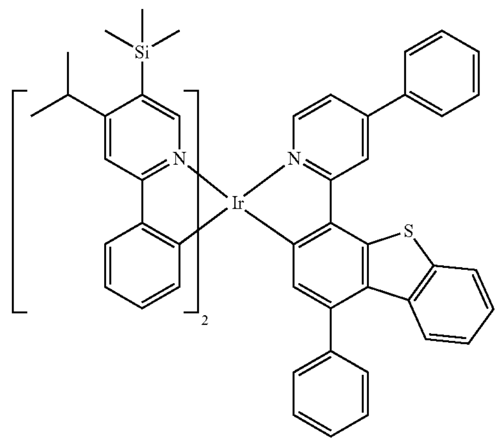
952
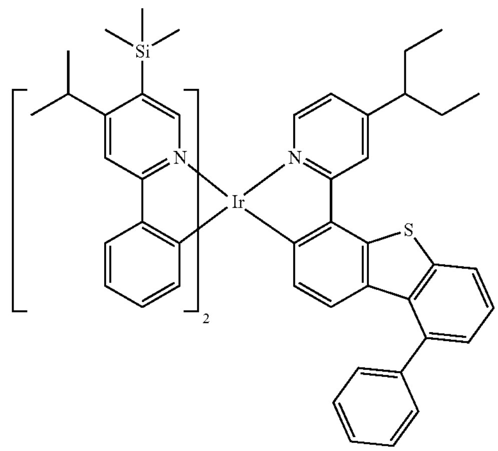
-continued
953
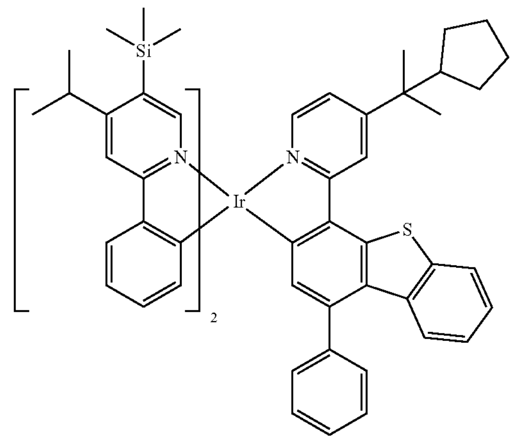
954
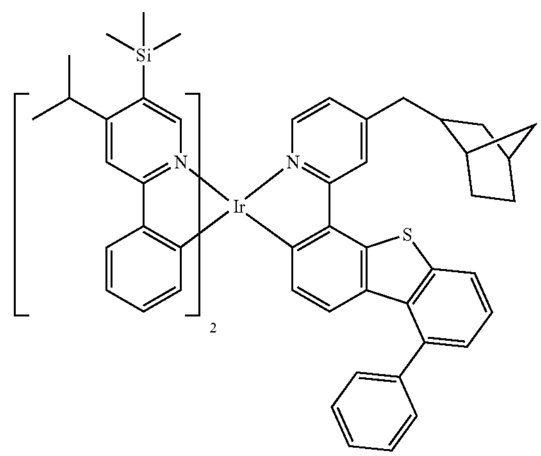
955
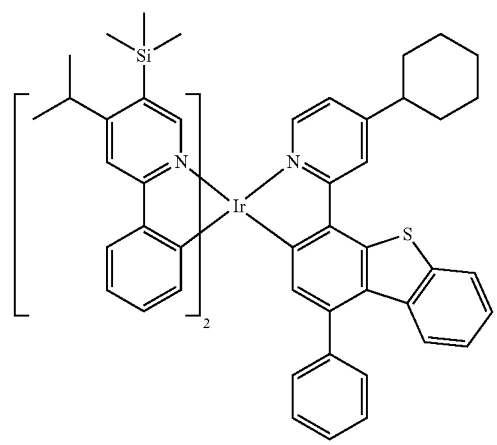

956
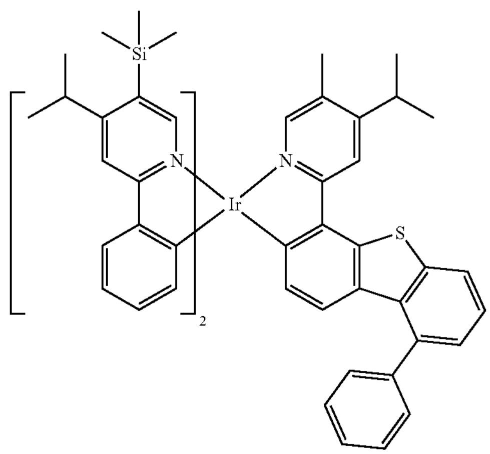
957
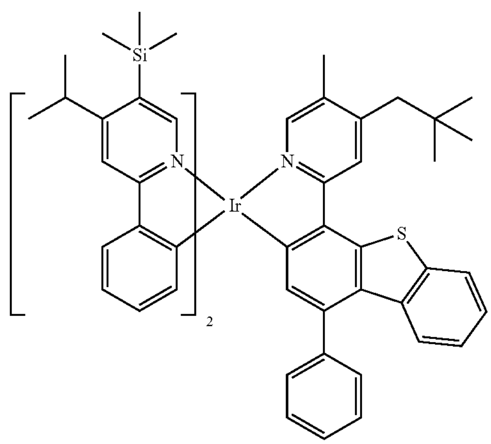
958
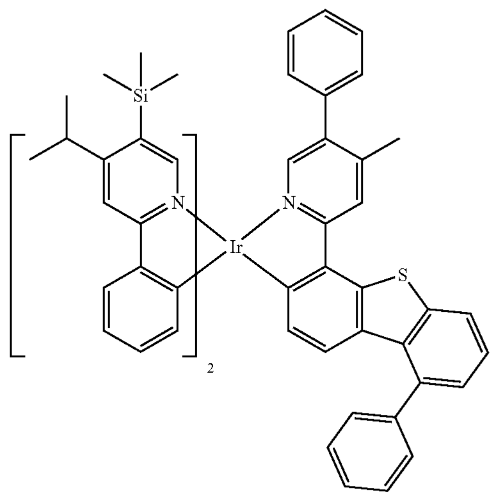
959
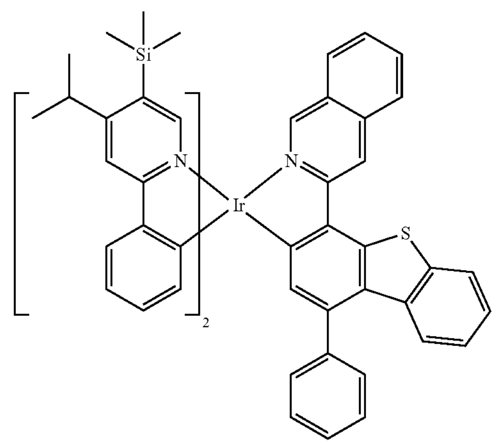
960
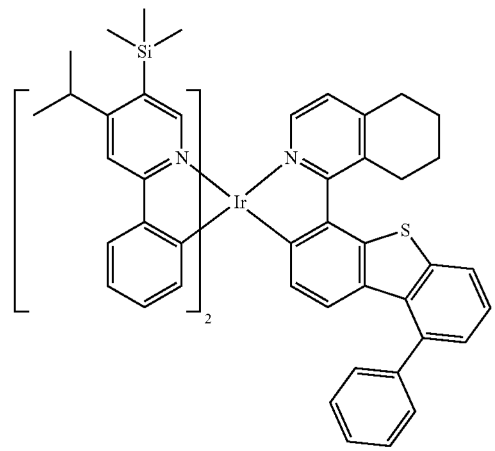
961
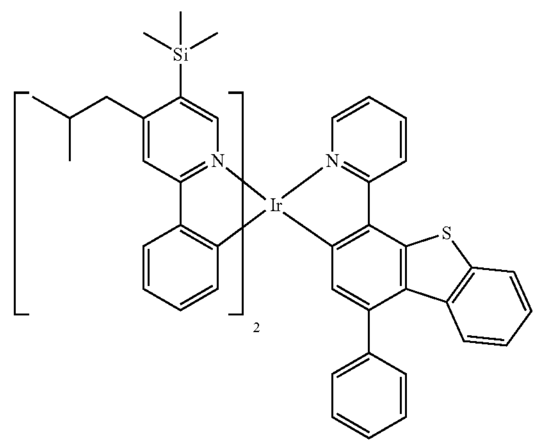

-continued
962
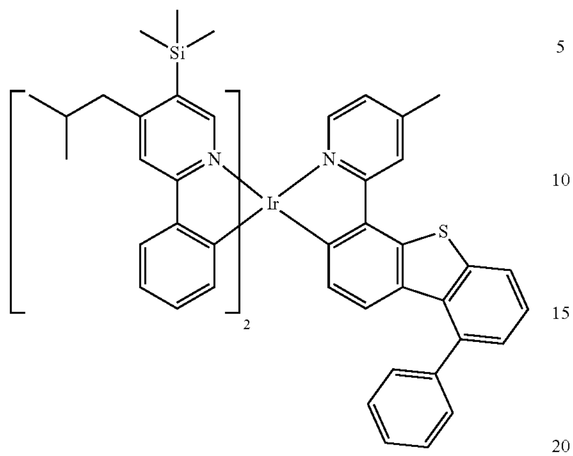
963
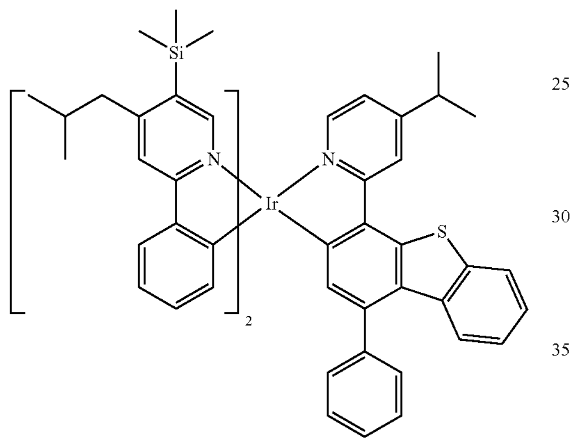
964
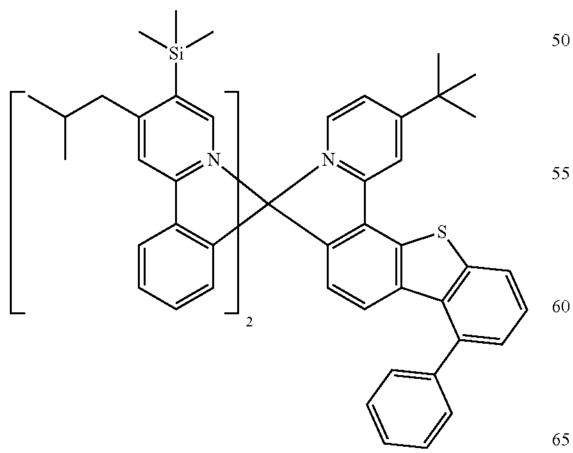
-continued
965
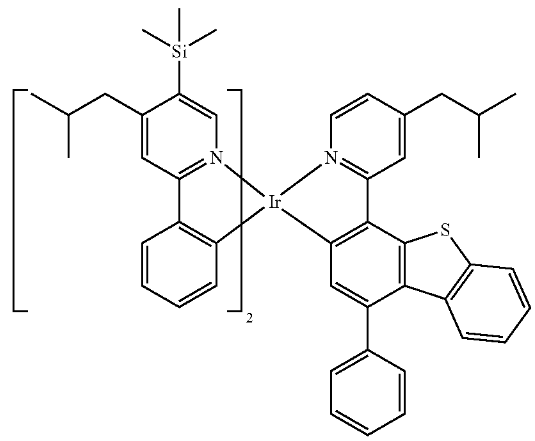
966
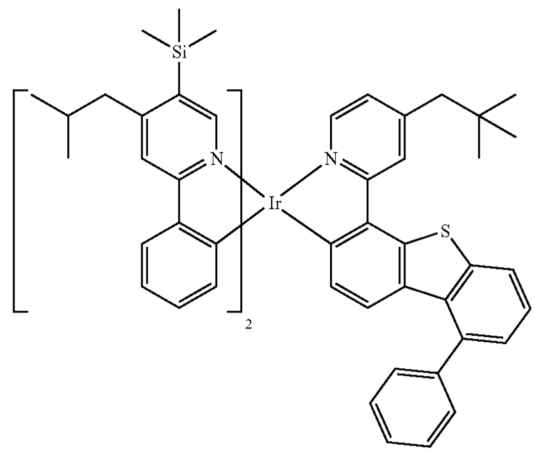
967
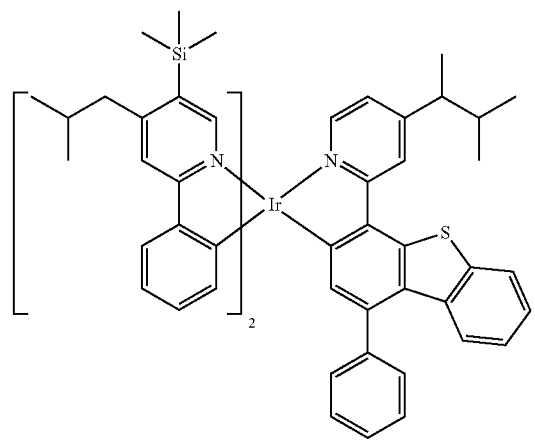

-continued
968
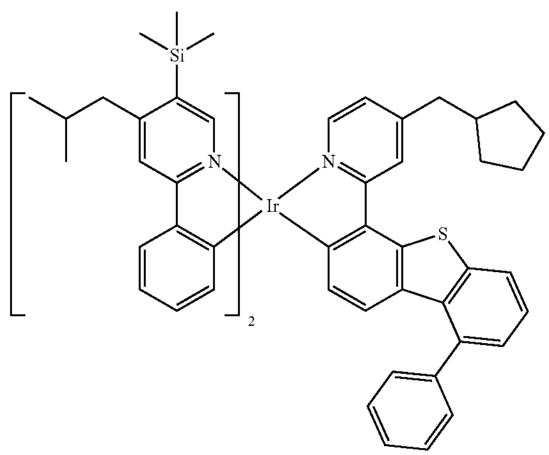
969
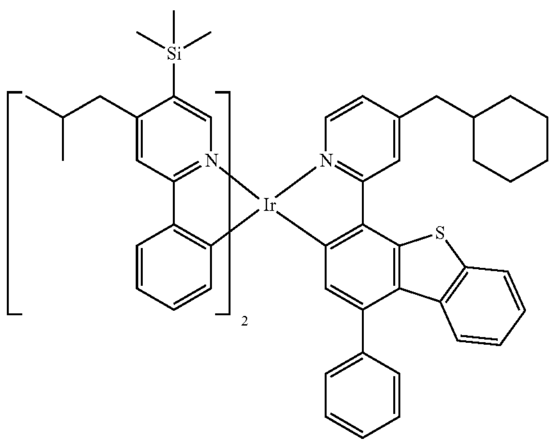
970
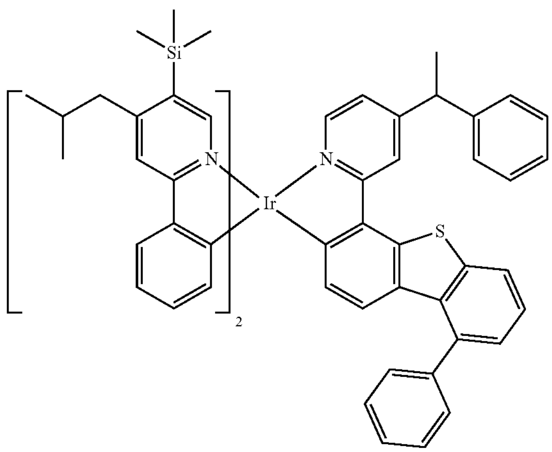
-continued
971
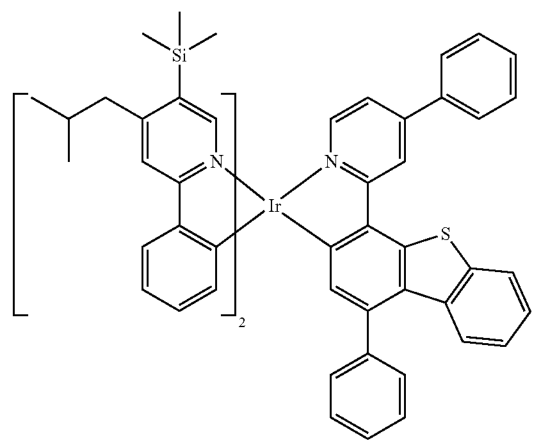
972
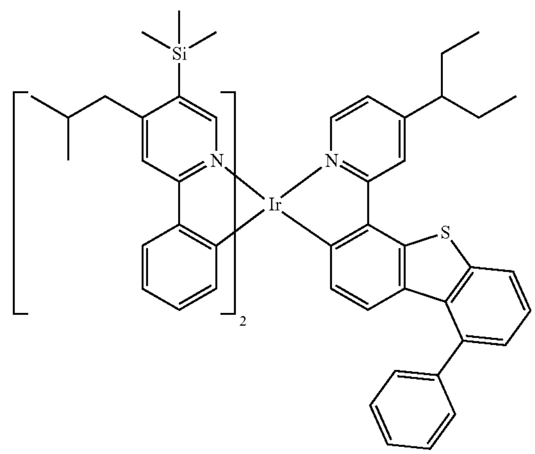
973
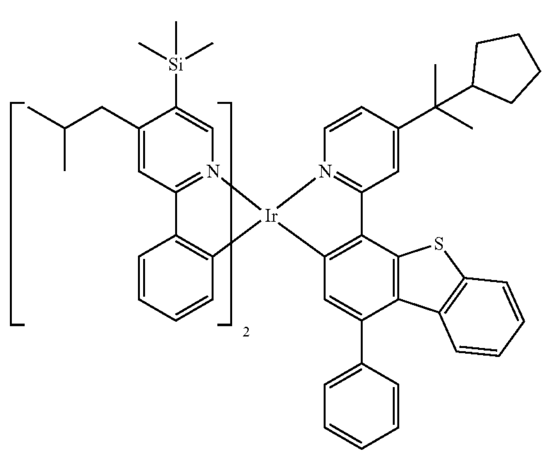

-continued
974
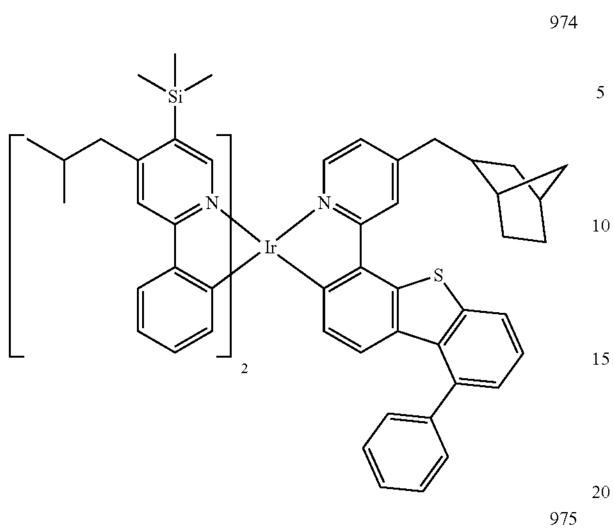
975
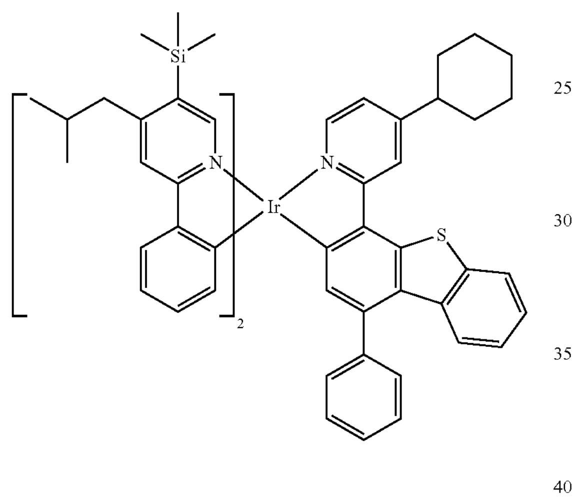
976
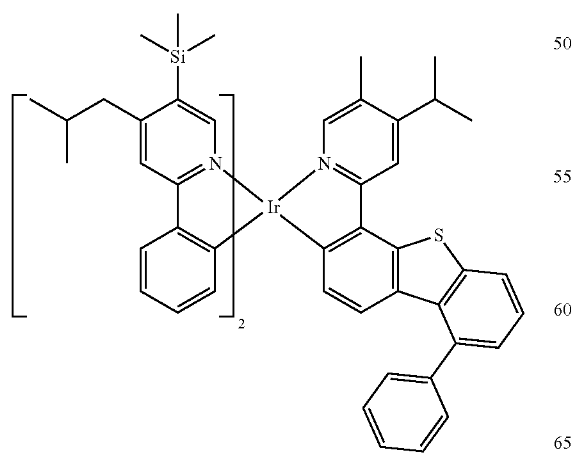
-continued
977
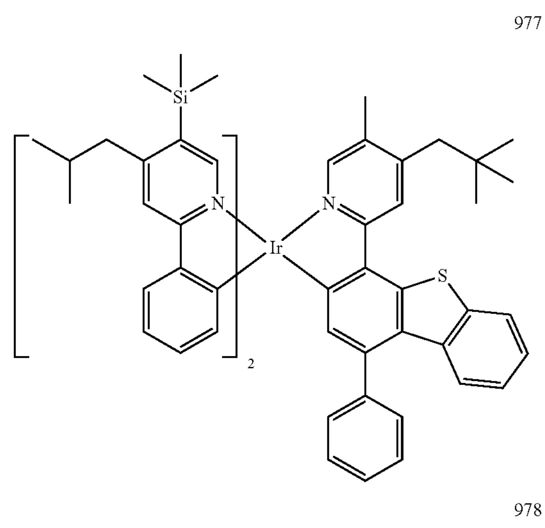
978
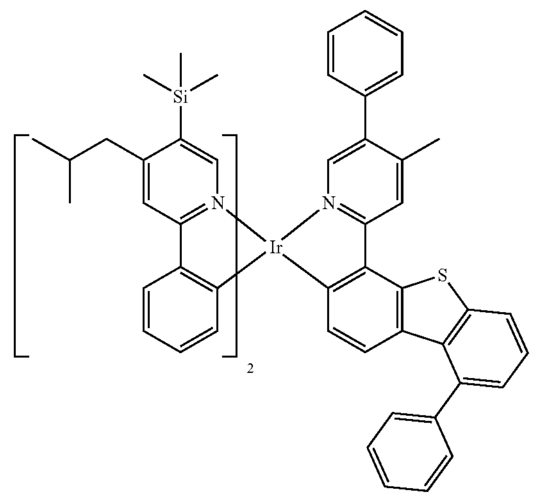
979
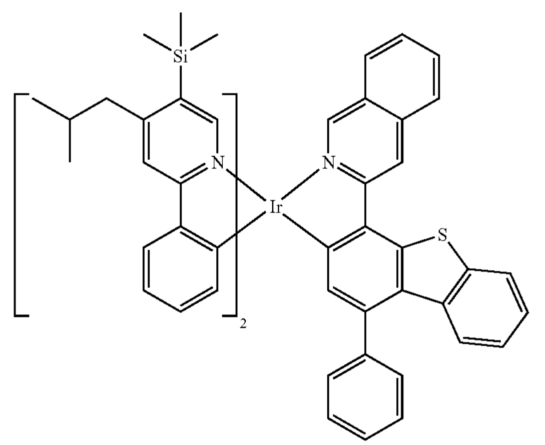

-continued
980
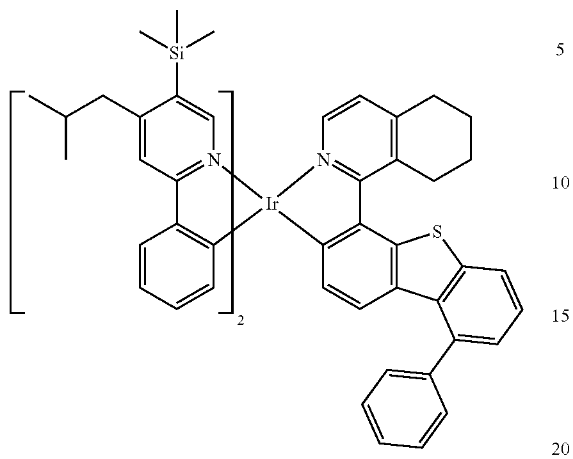
981
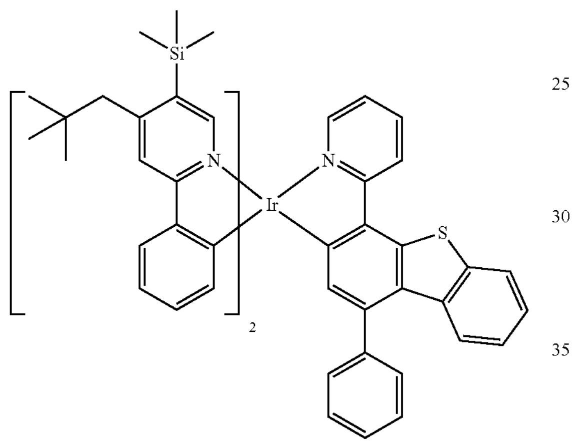
982
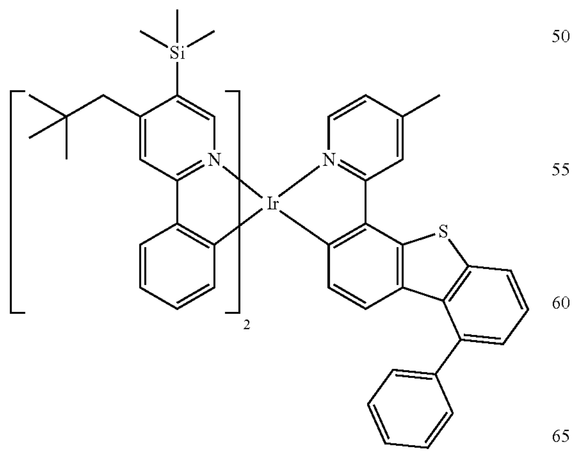
-continued
983
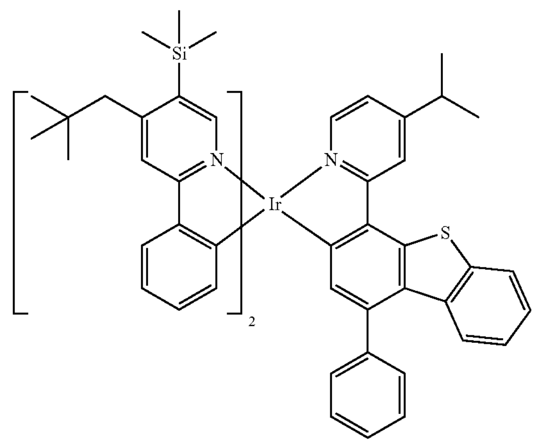
984
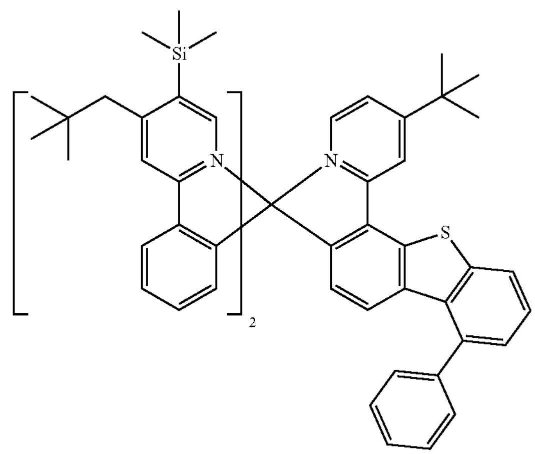
985
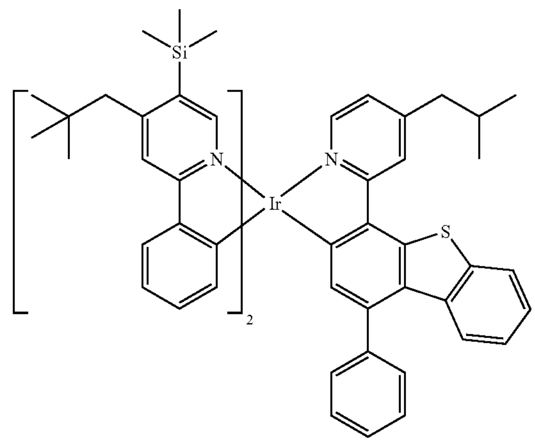

-continued
986
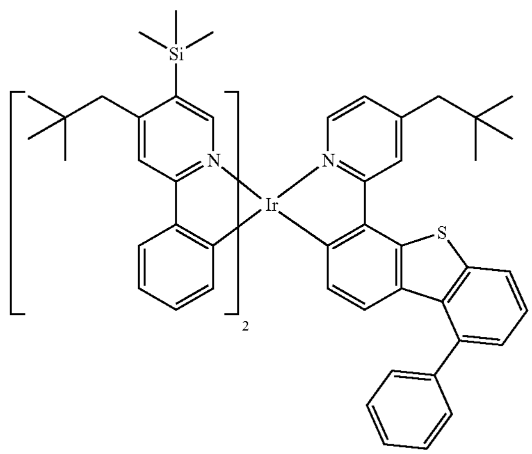
987
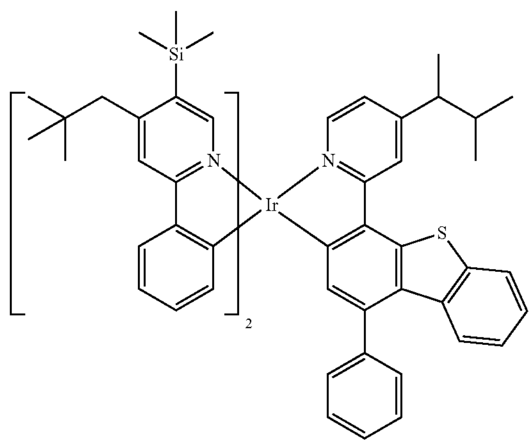
988
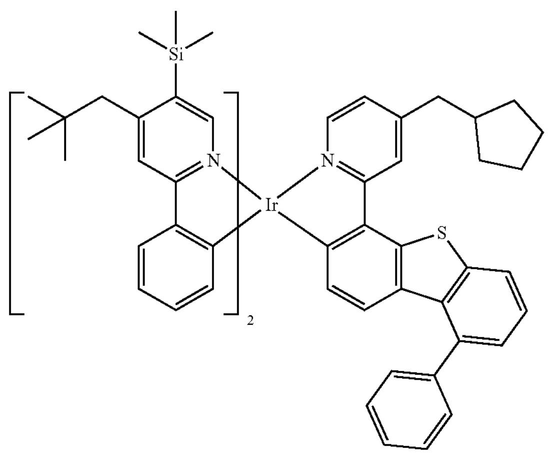
-continued
989
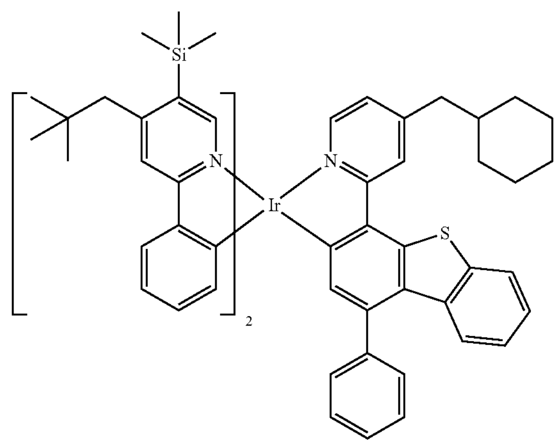
990
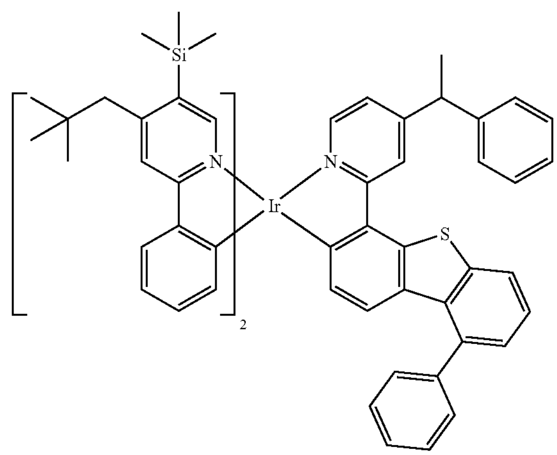
991
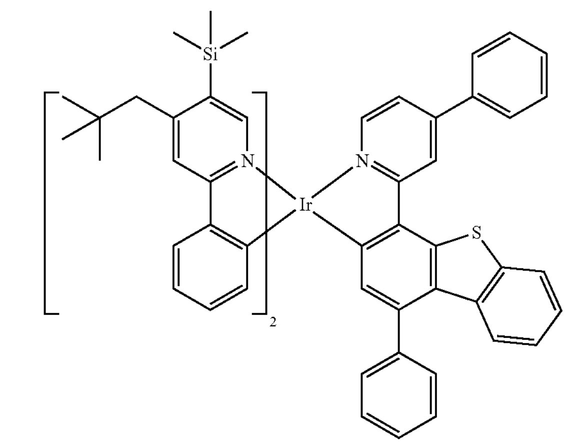

-continued
992
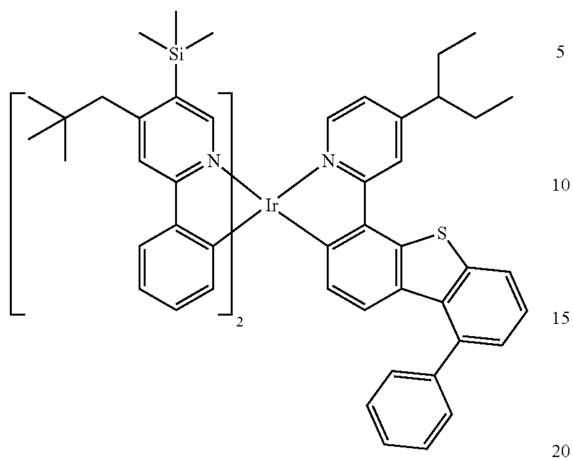
993
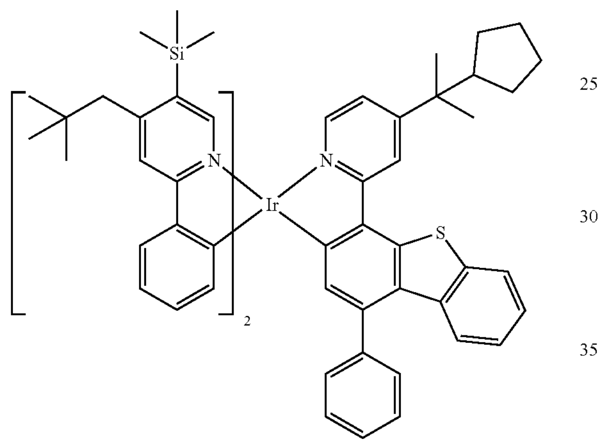
994
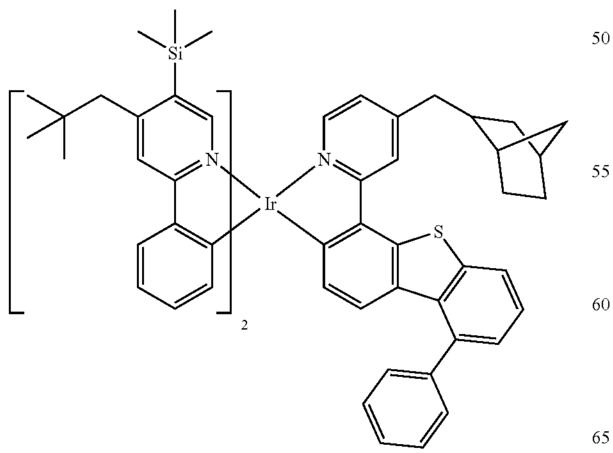
-continued
995
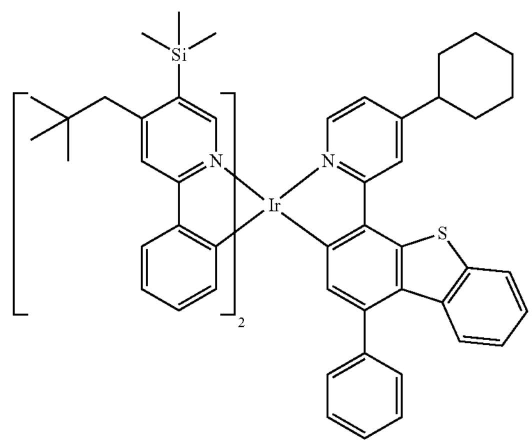
996
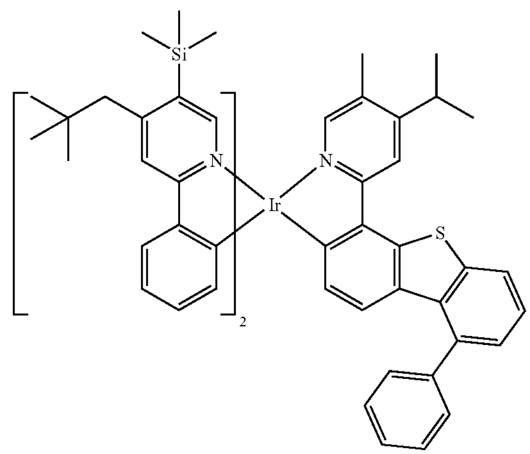
997
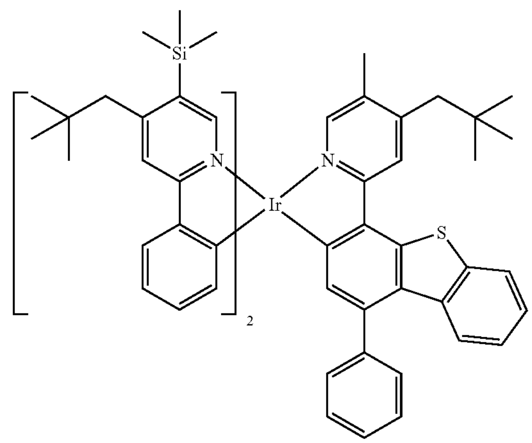

-continued
998
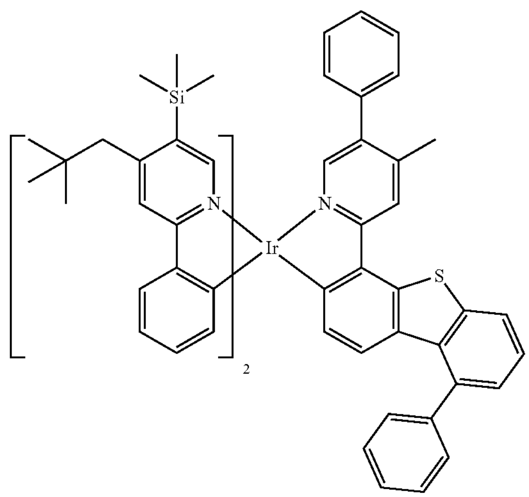
999
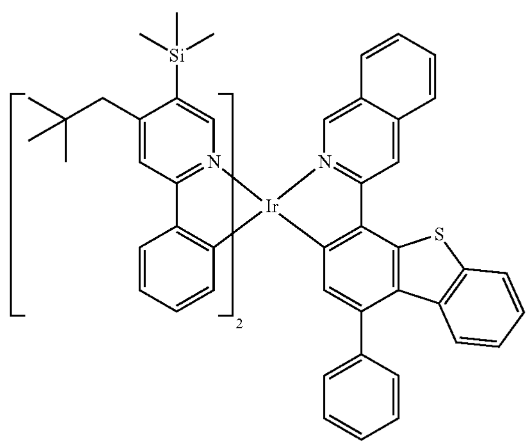
1000
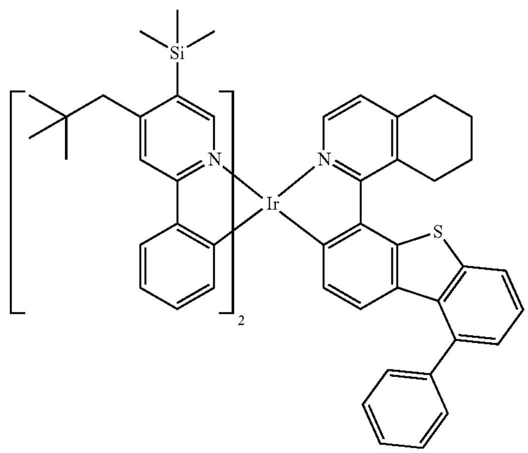
-continued
1001
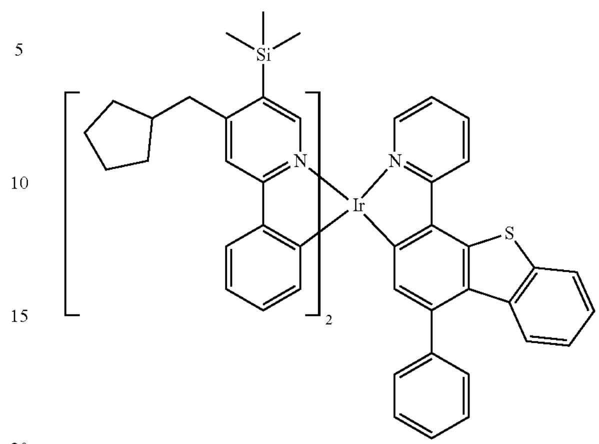
1002
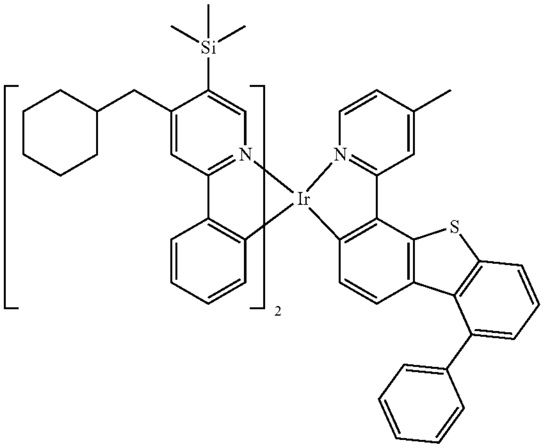
1003
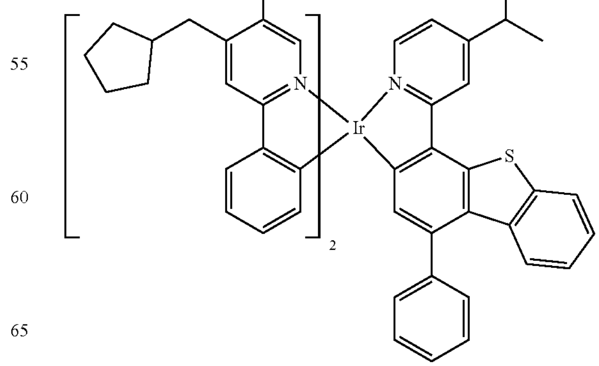

-continued
1004
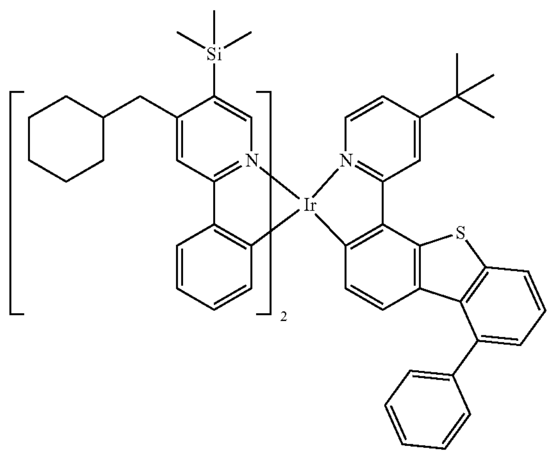
1005
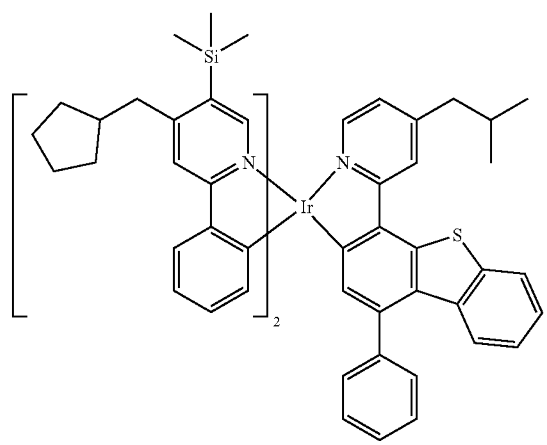
1006
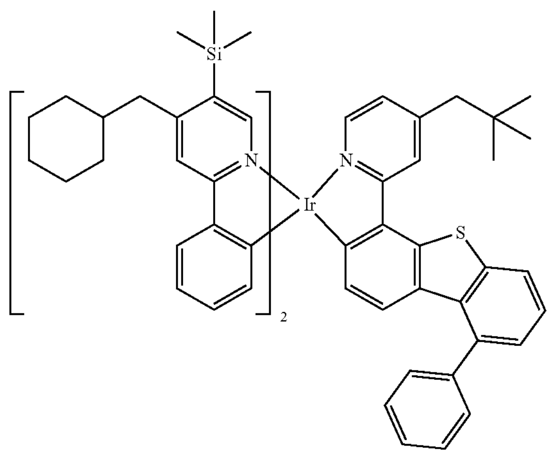
-continued
1007
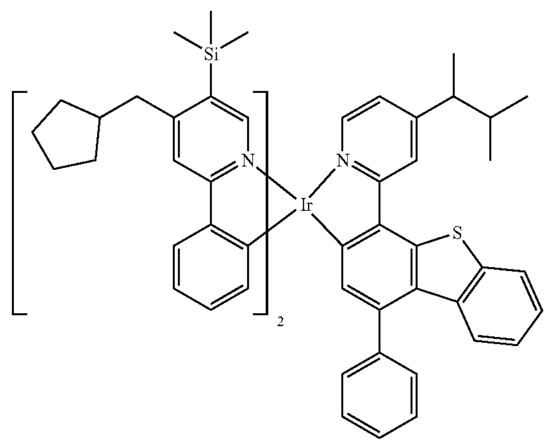
1008
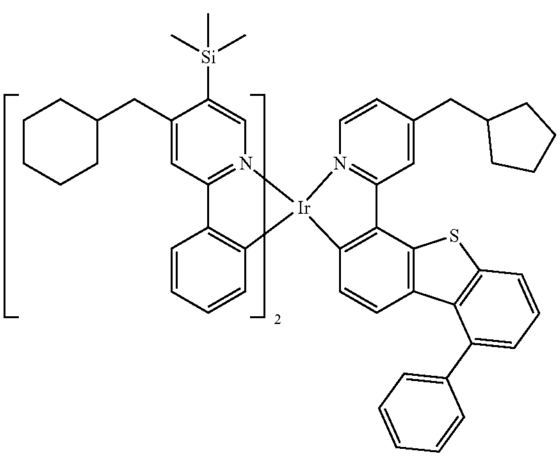
1009
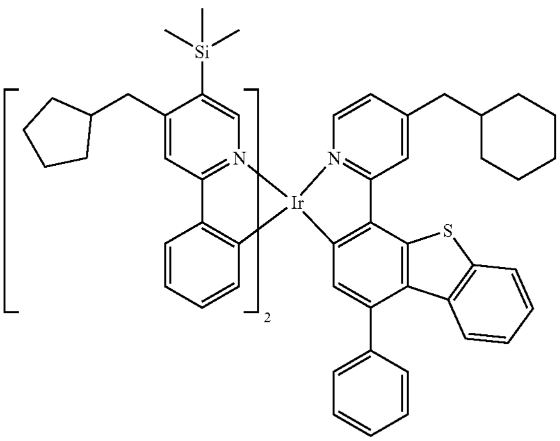

-continued
1010
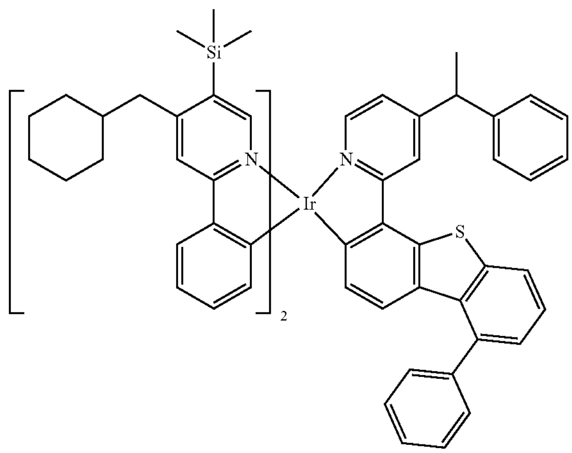
1011
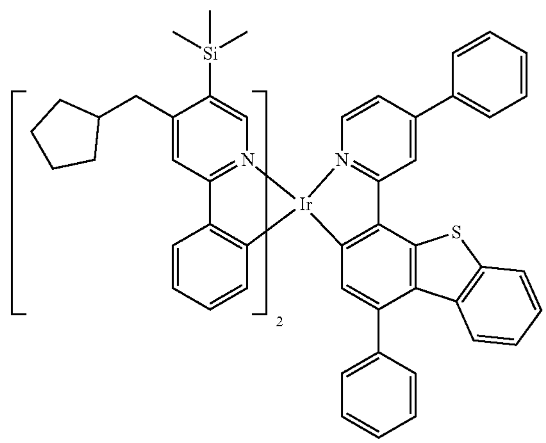
1012
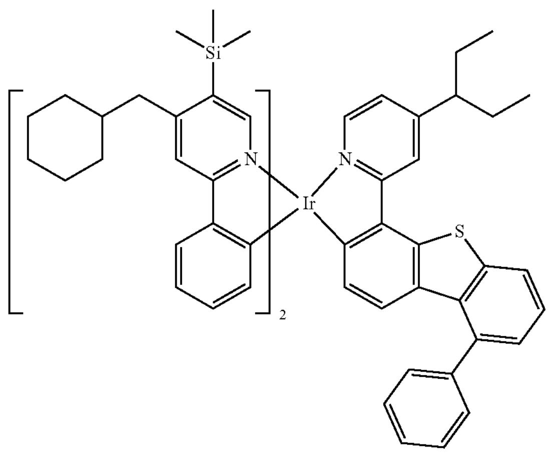
-continued
1013
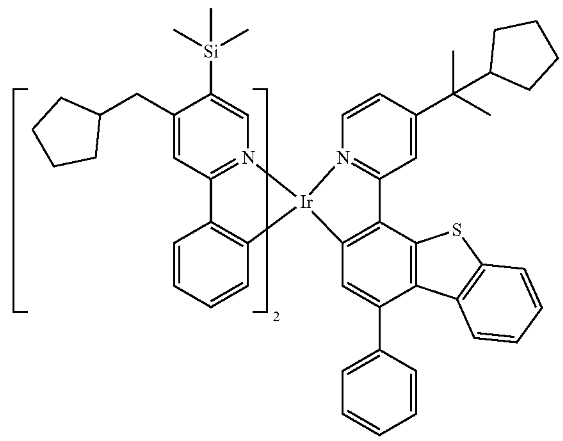
1014
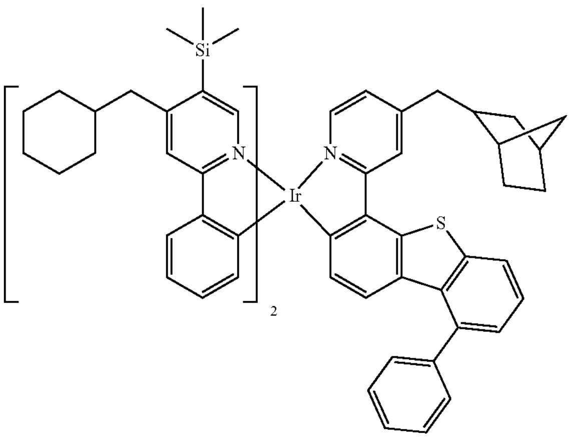
1015
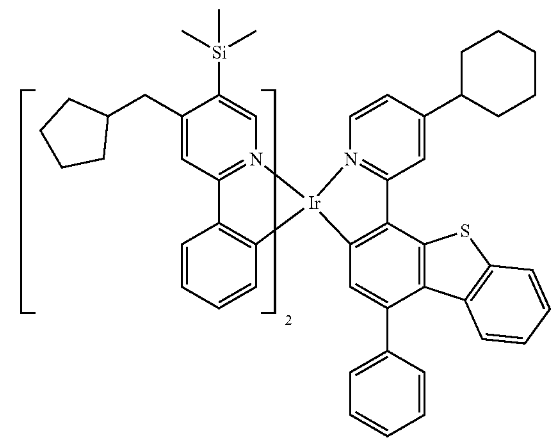

-continued
1016
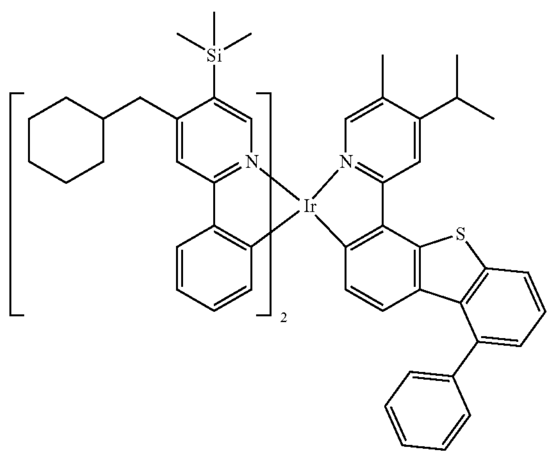
1017
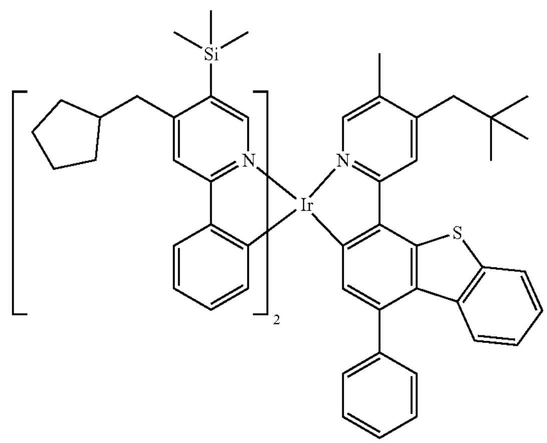
1018
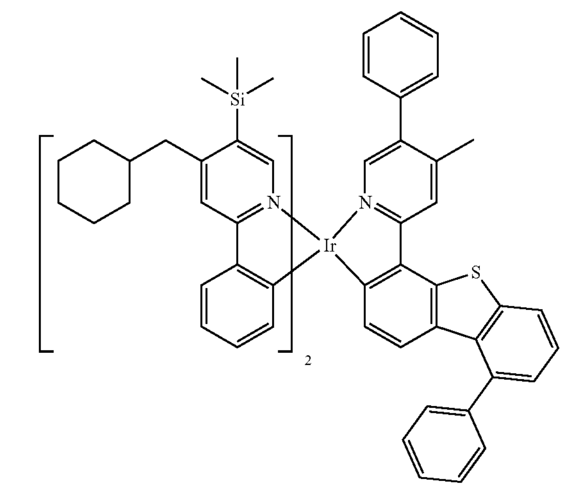
-continued
1019
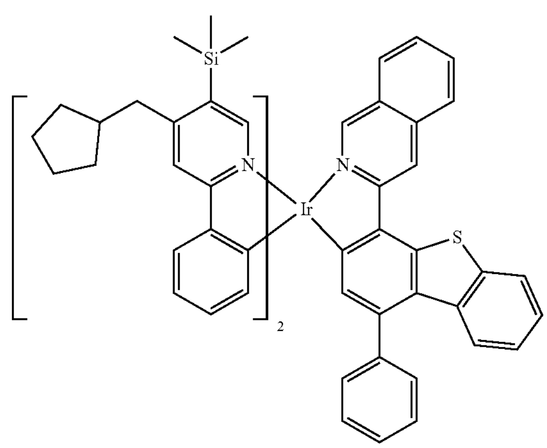
1020
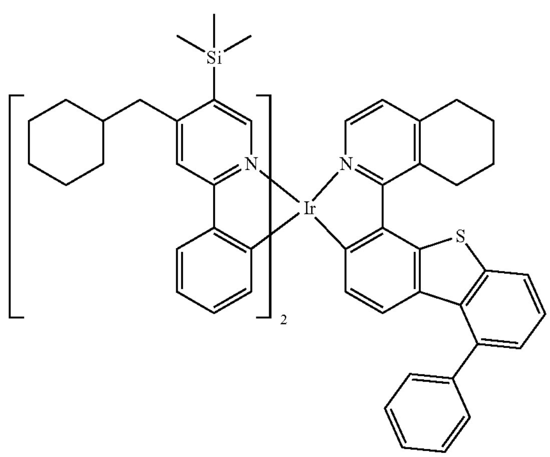
1021
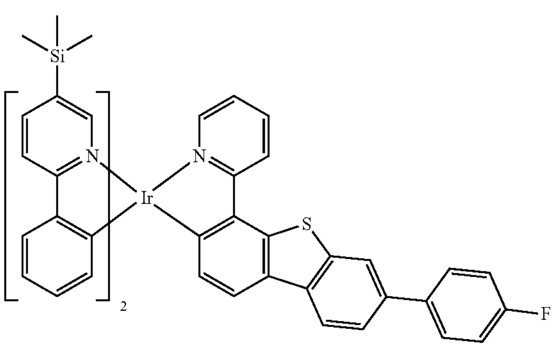

1022
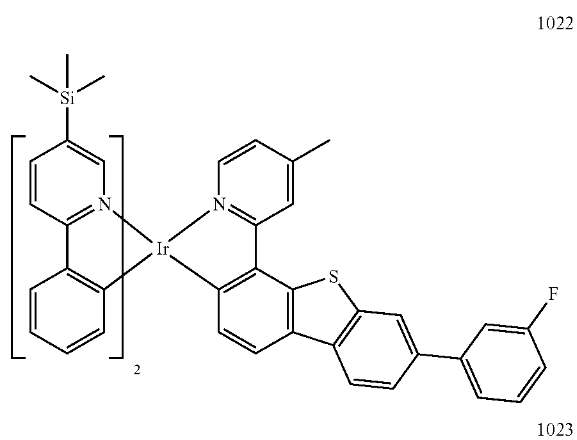
1023
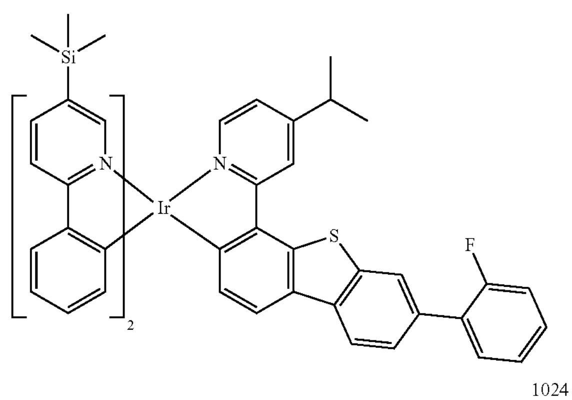
1024
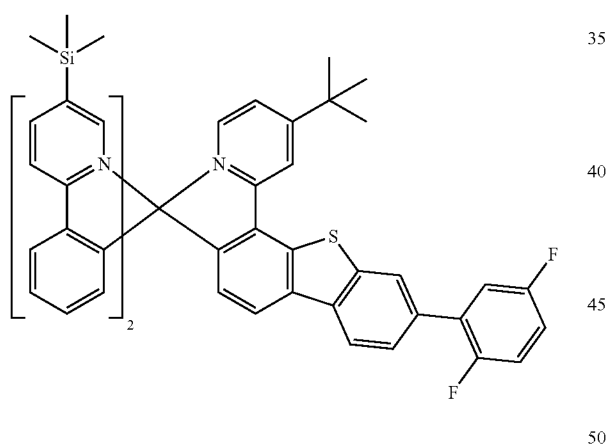
1021
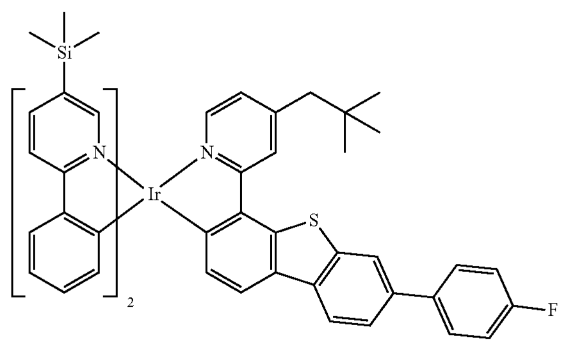
1022
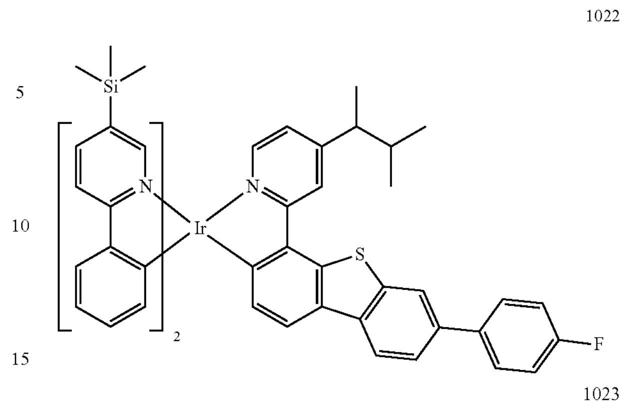
1023
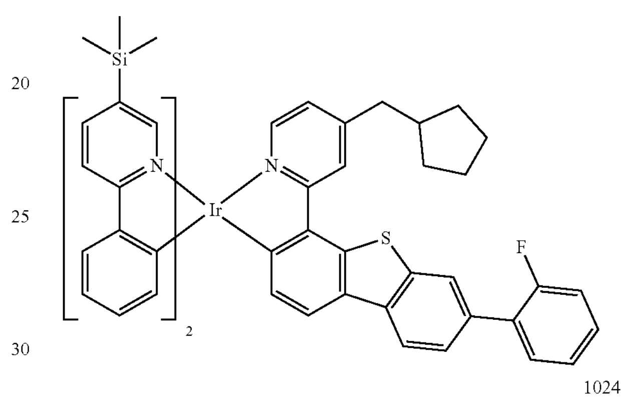
1024
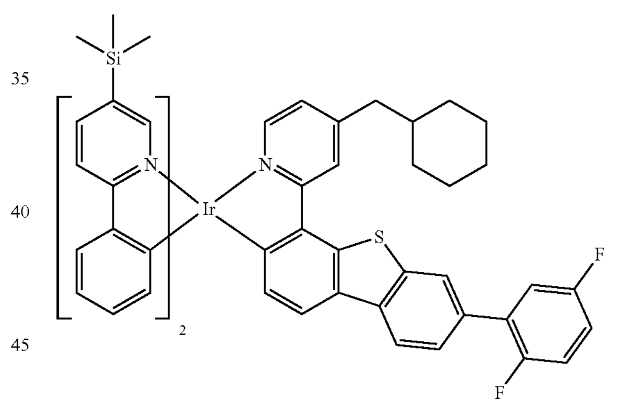
1025
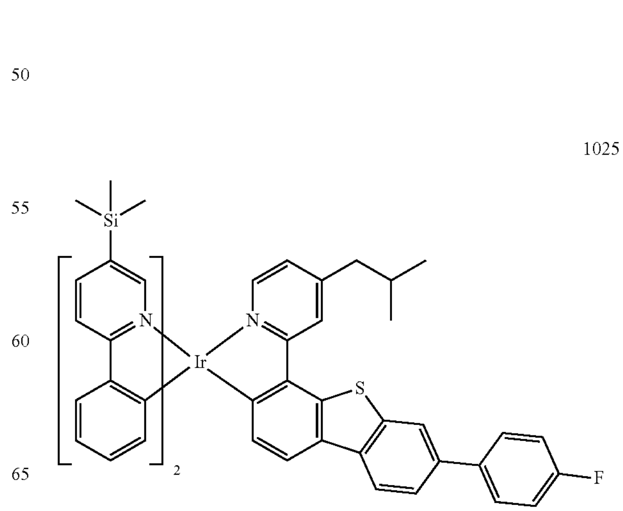

-continued
1026
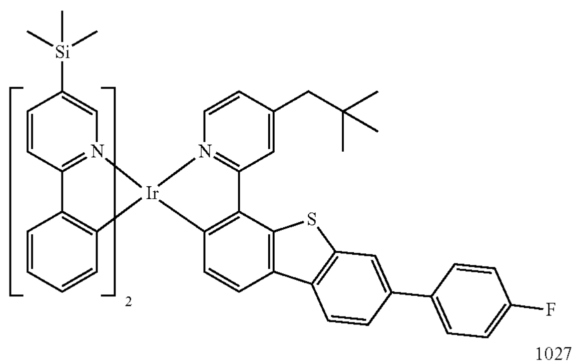
1027
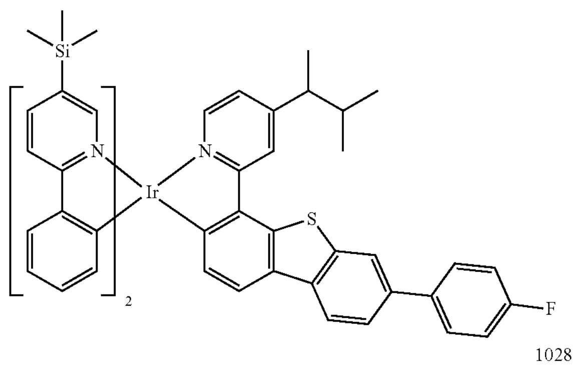
1028
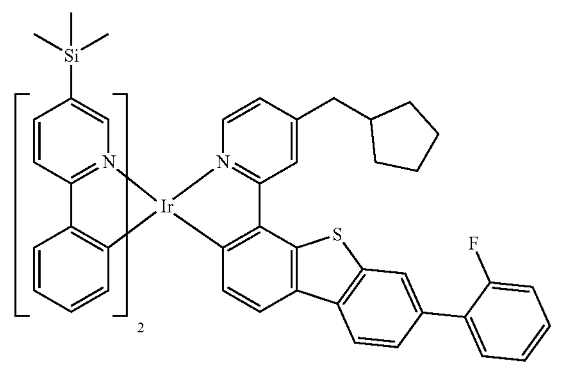
1029
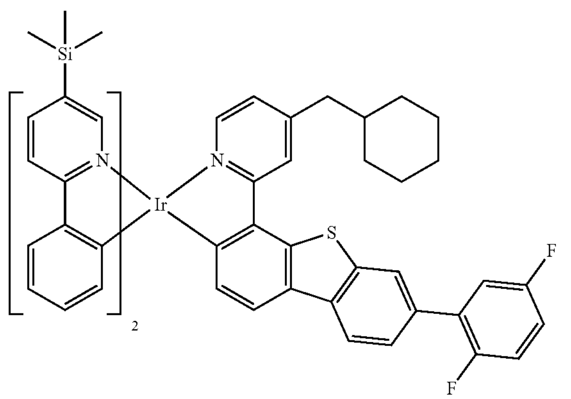
-continued
1030
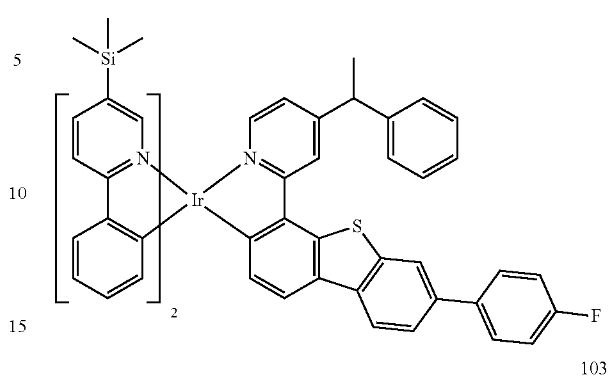
1031
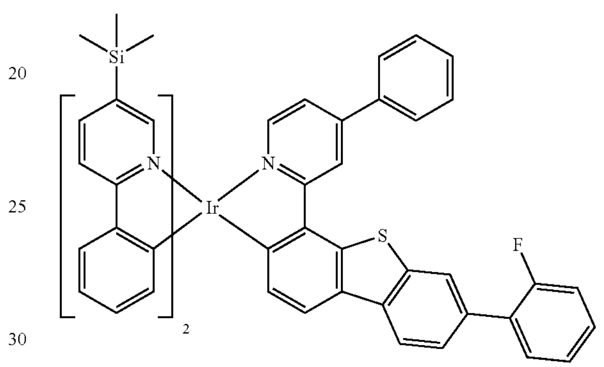
1032
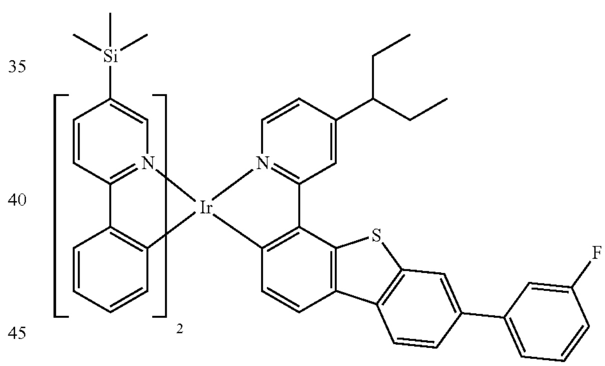
1033
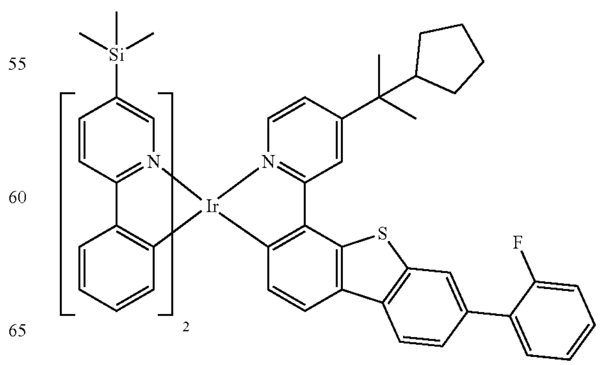

-continued
1034
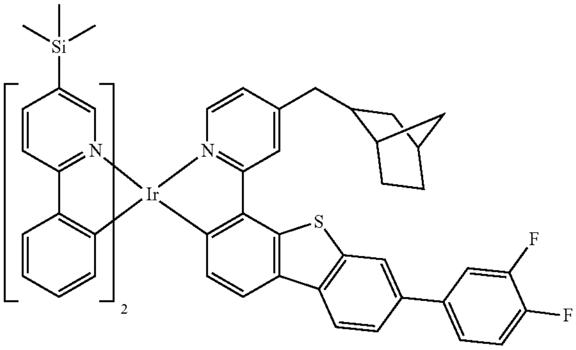
1038
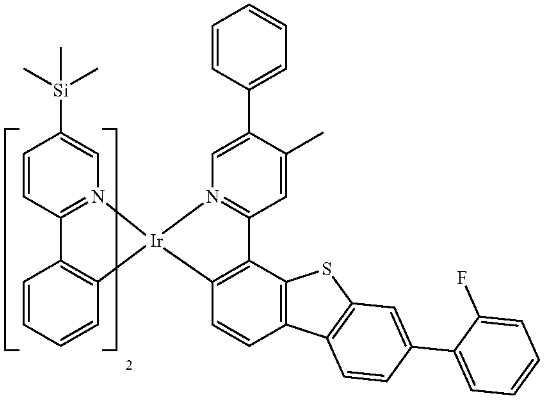
1035
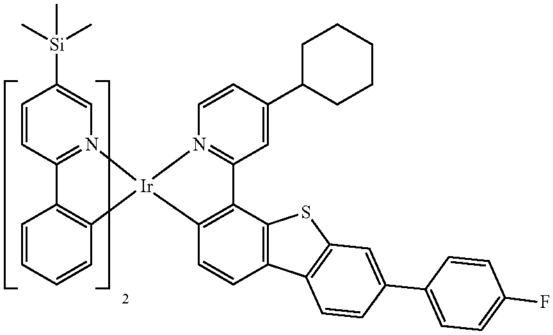
1039
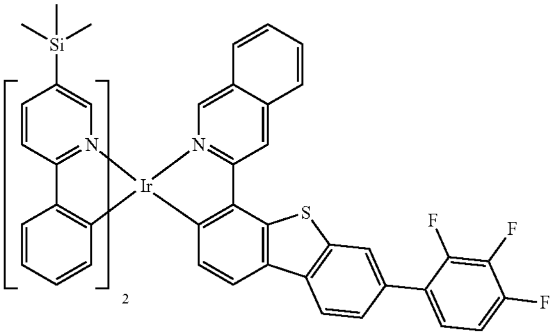
1036
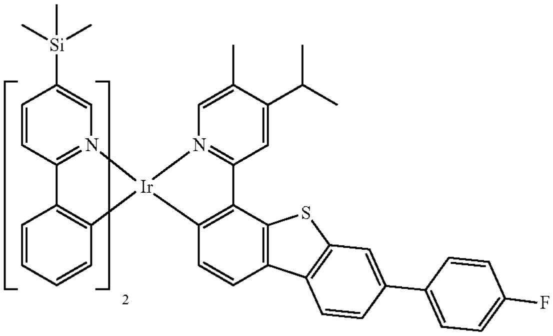
1040
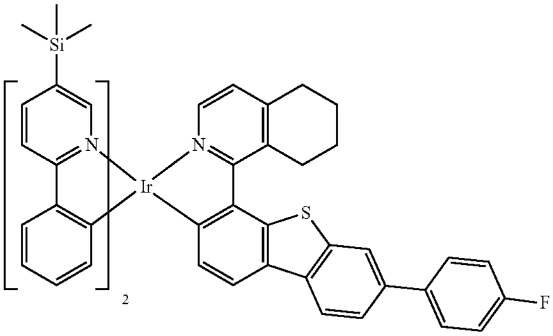
1037
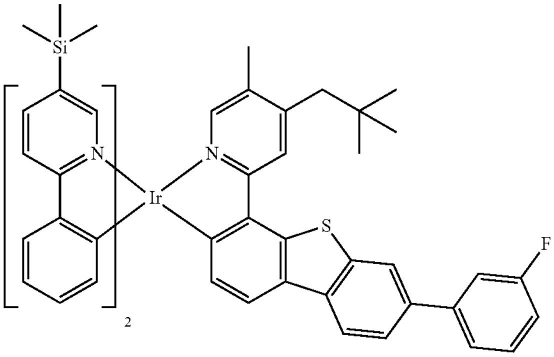
1041
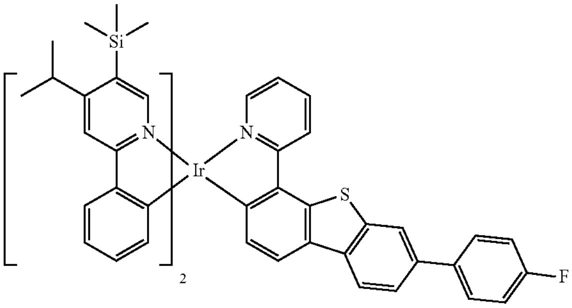

-continued
1042
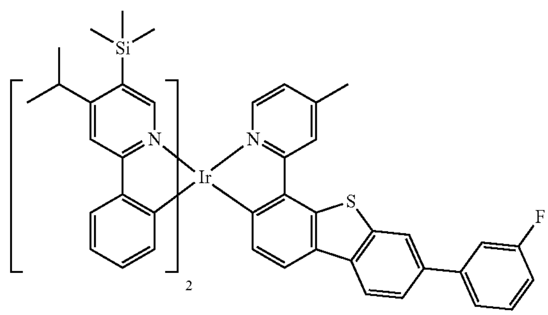
1043
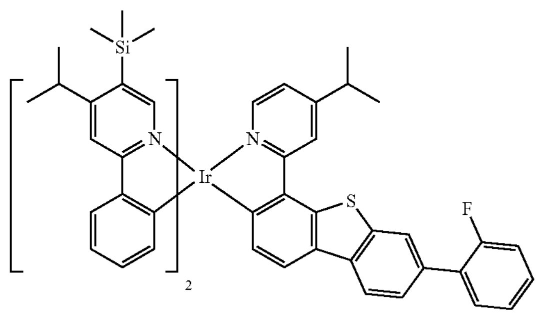
1044
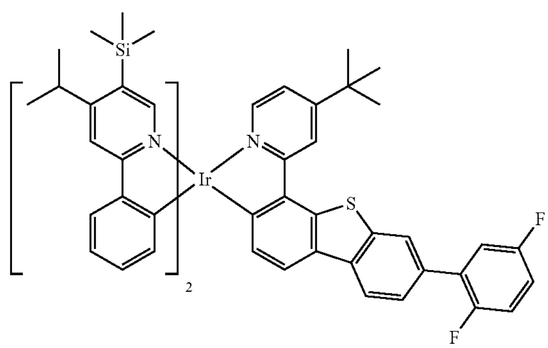
1045
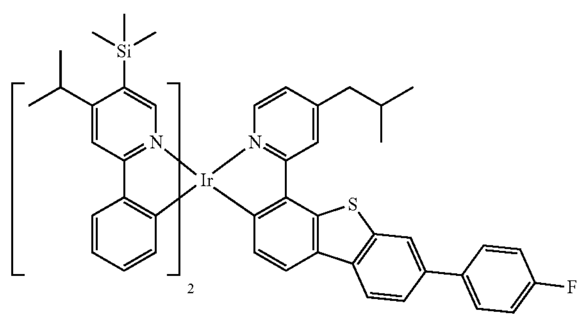
-continued
1046
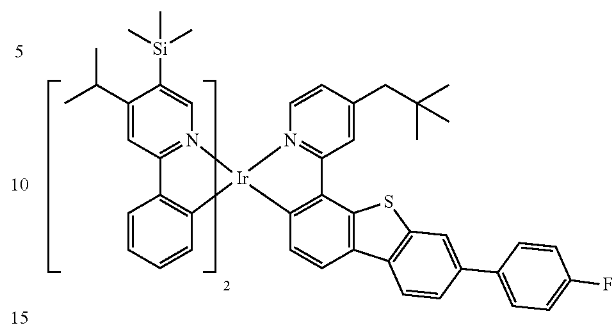
1047
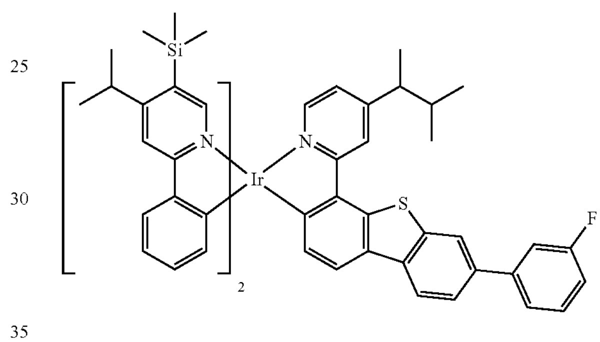
1048
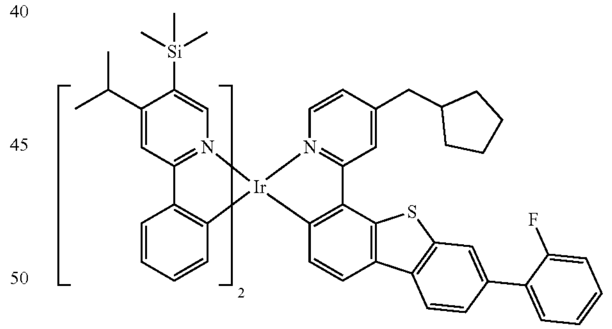
1049
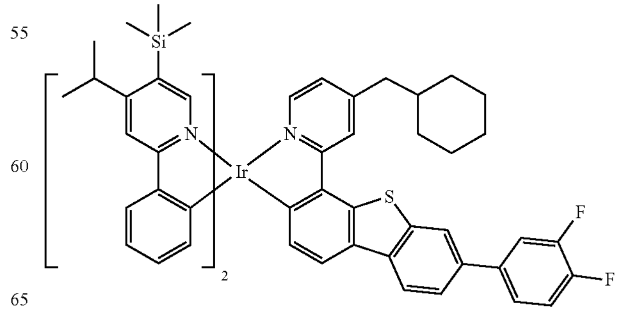

-continued
1050
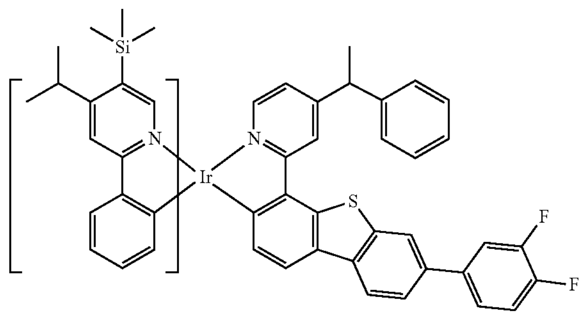
1051
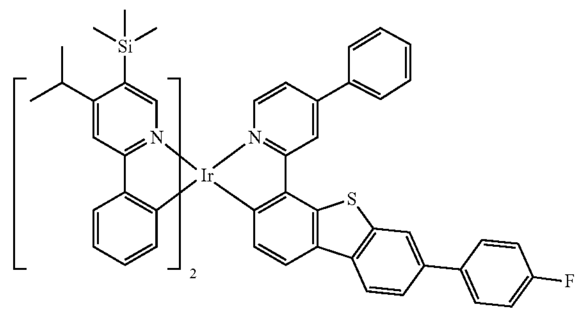
1052
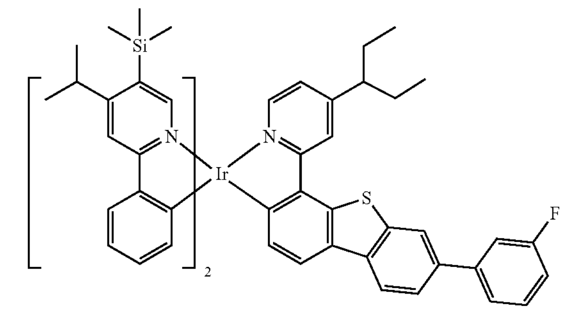
1053
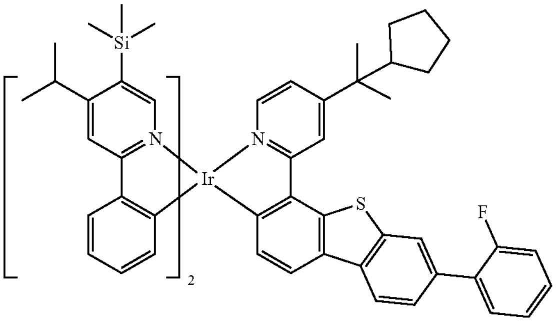
-continued
1054
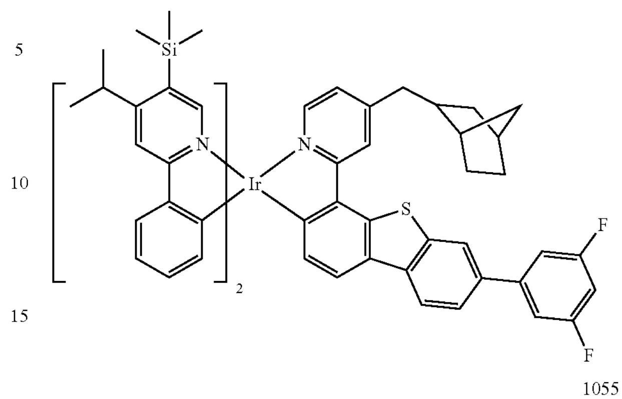
1055
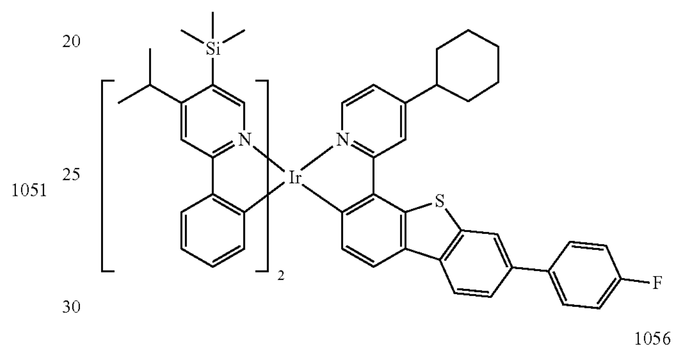
1056
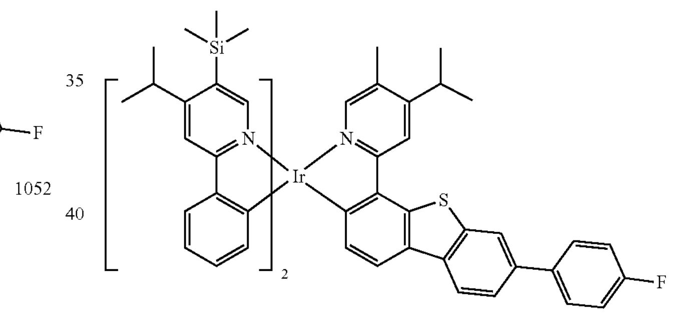
1057
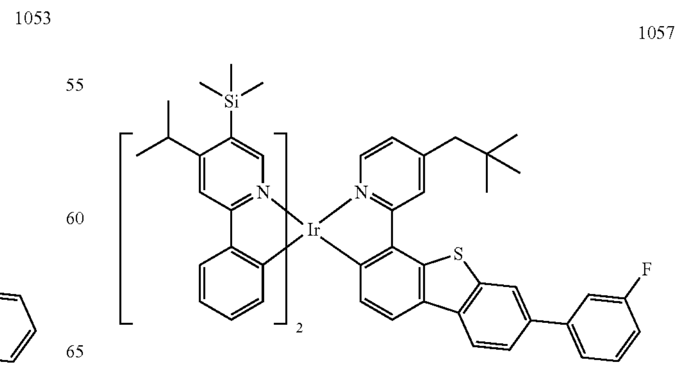

-continued
1058
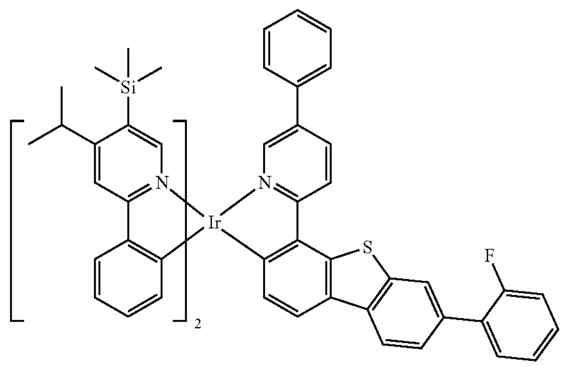
1059
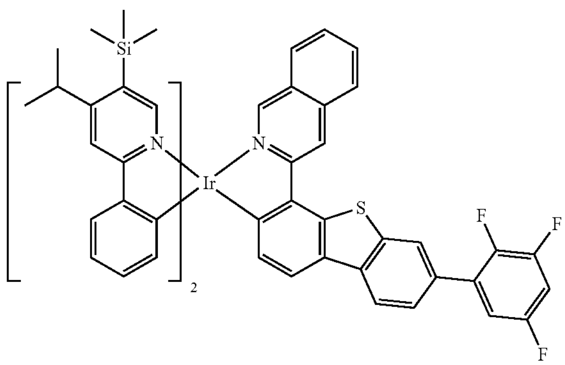
1060
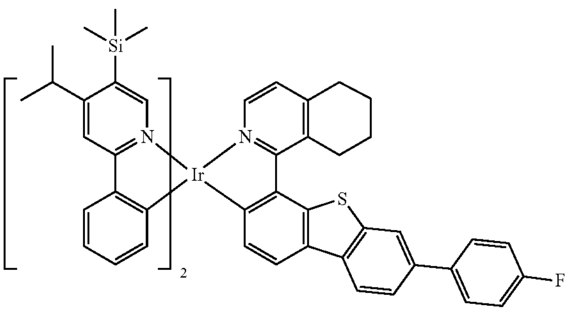
1061
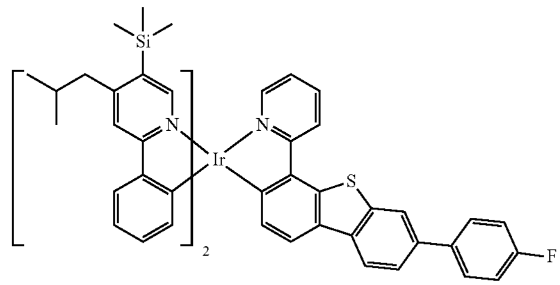
-continued
1062
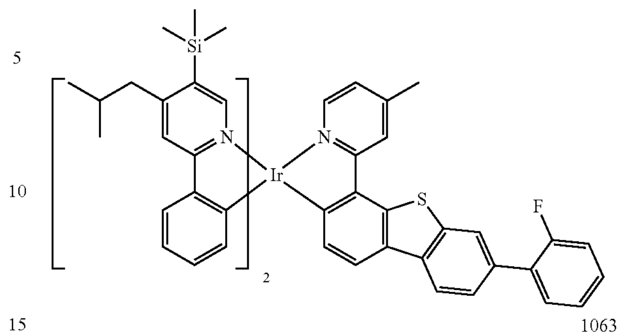
1063
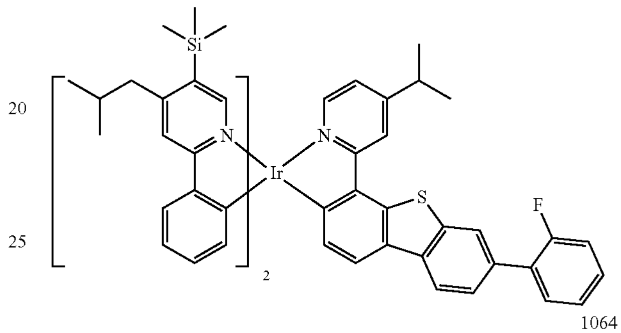
1064
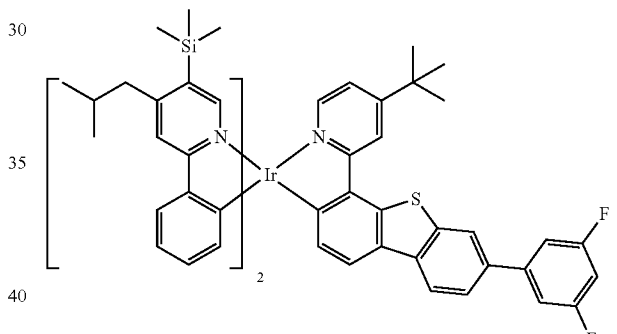
1065
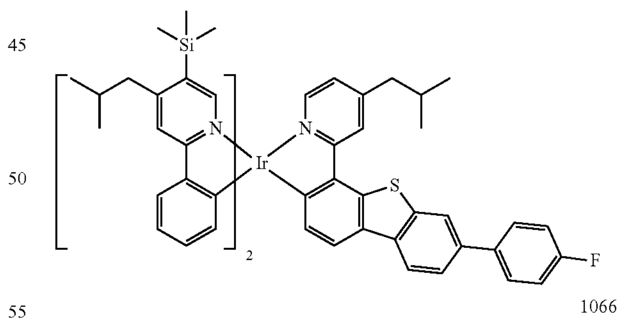
1066
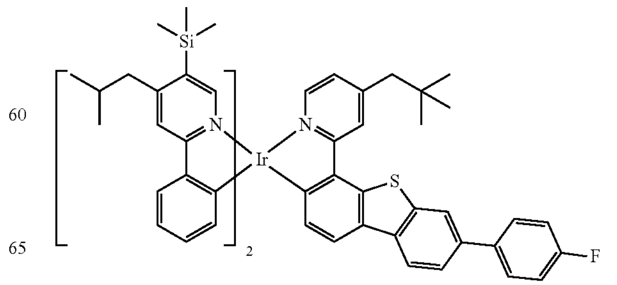

-continued
1067
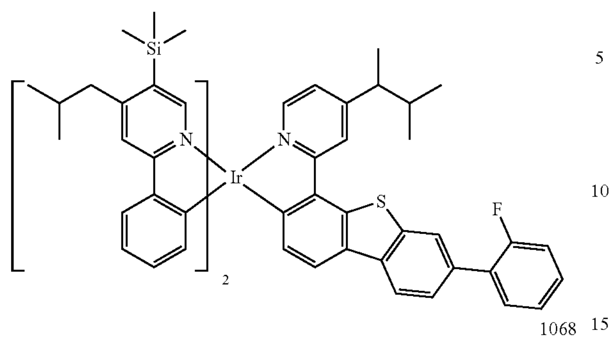
1068
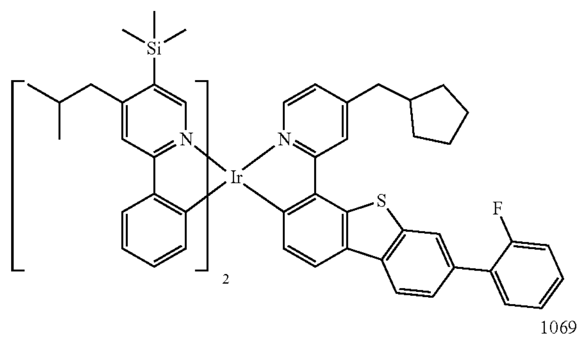
1069
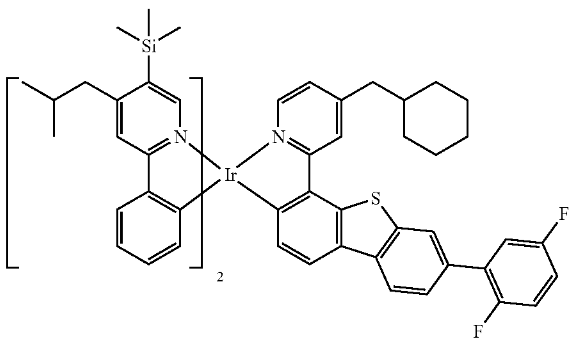
1070
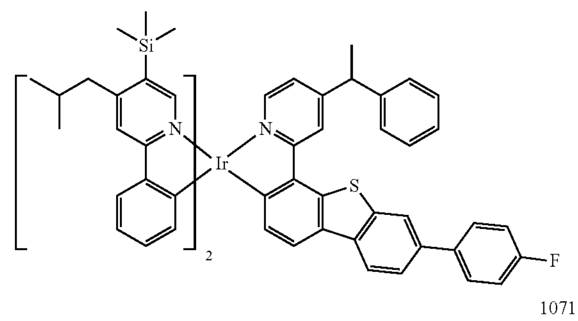
1071
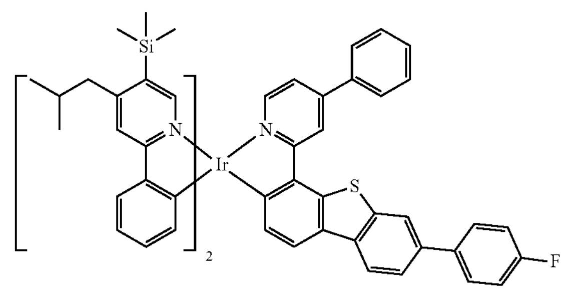
-continued
1072
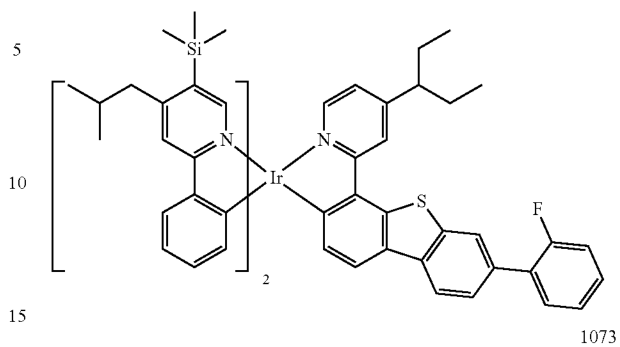
1073
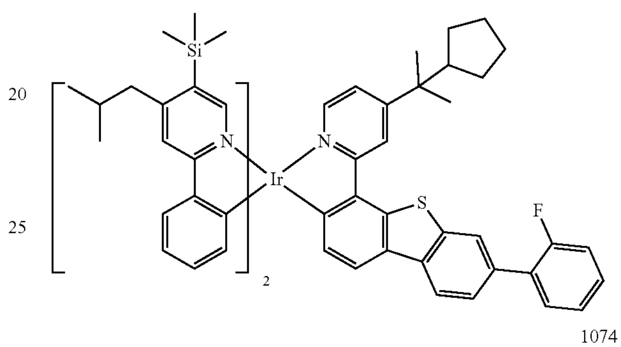
1074
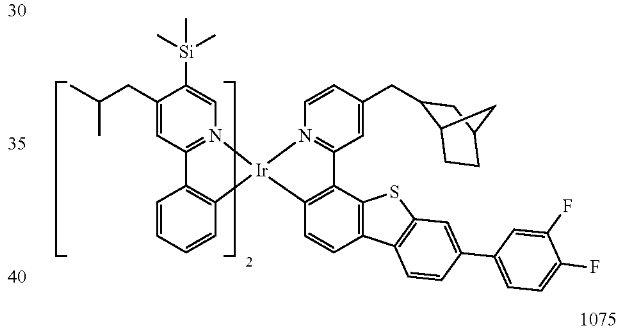
1075
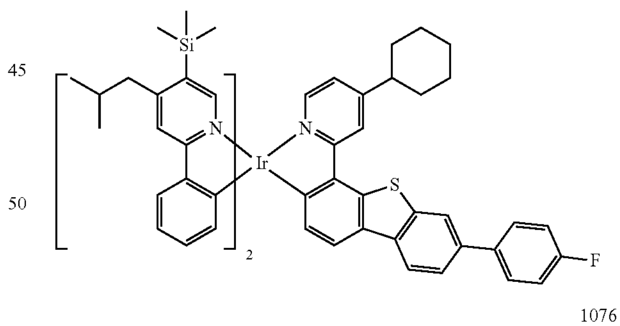
1076
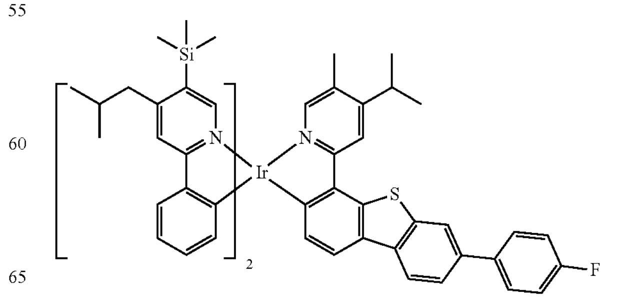

-continued
1077
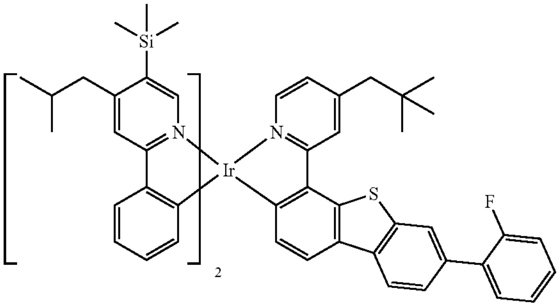
1078
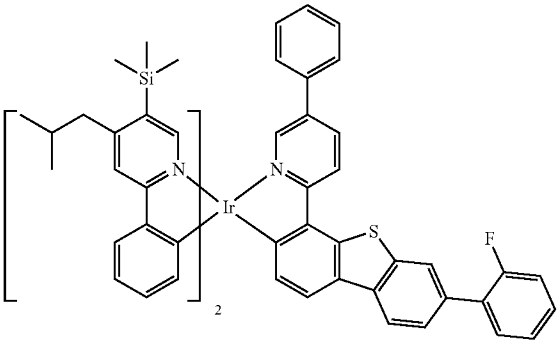
1079
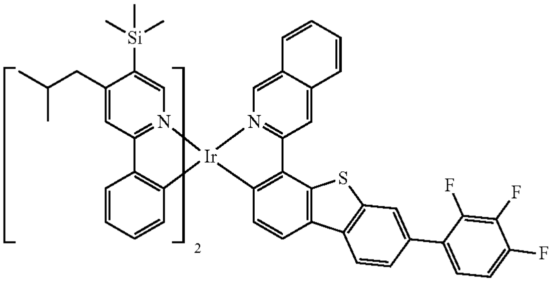
1080
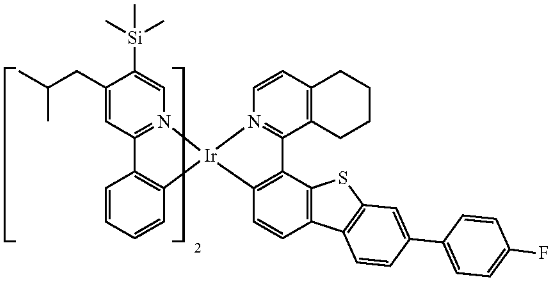
-continued
1081
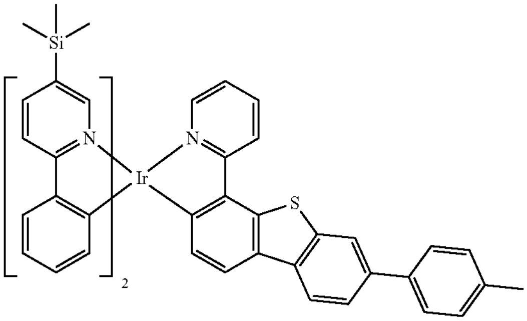
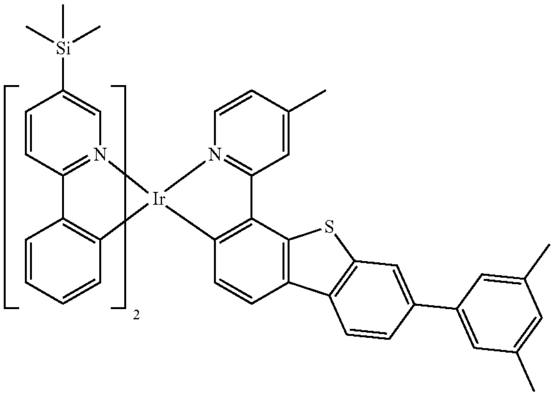
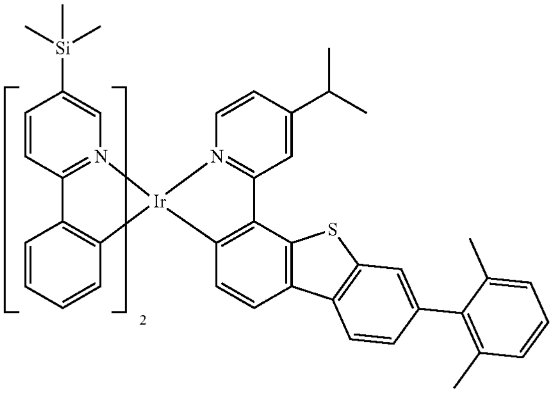
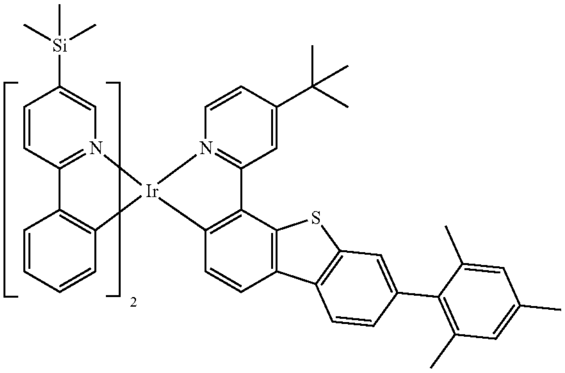

1085
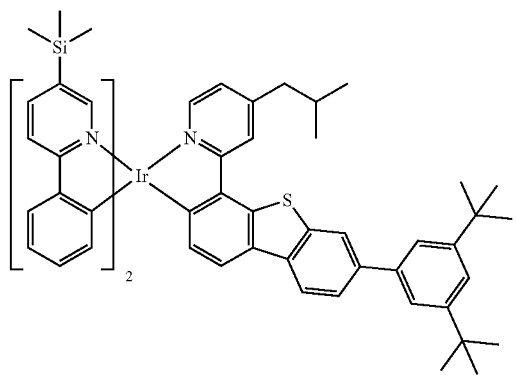
1086
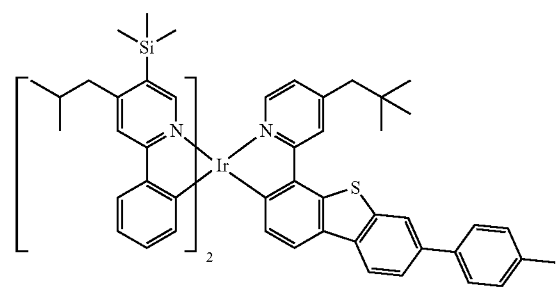
1087
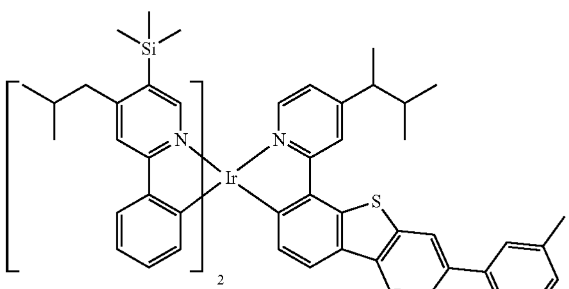
1088
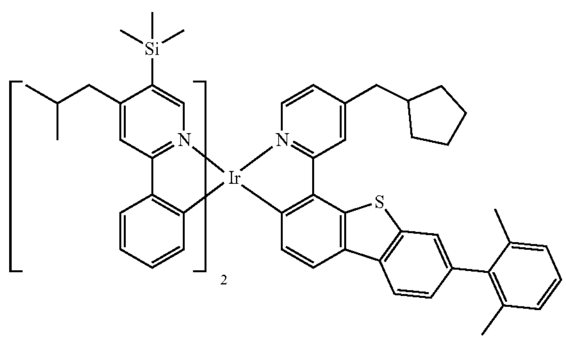
1089
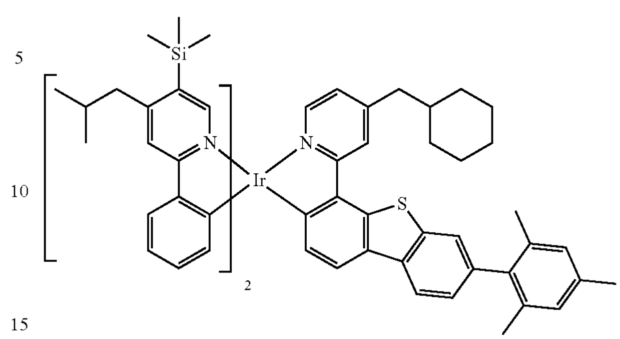
1090
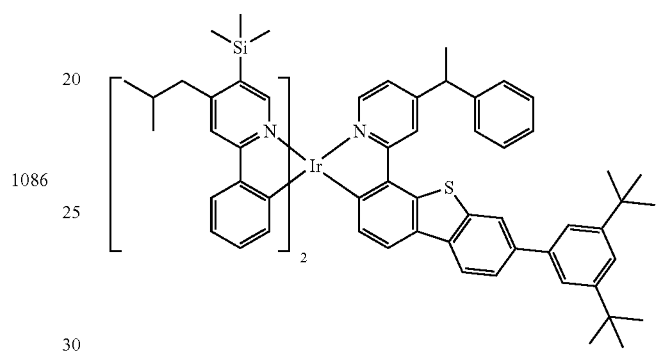
1091
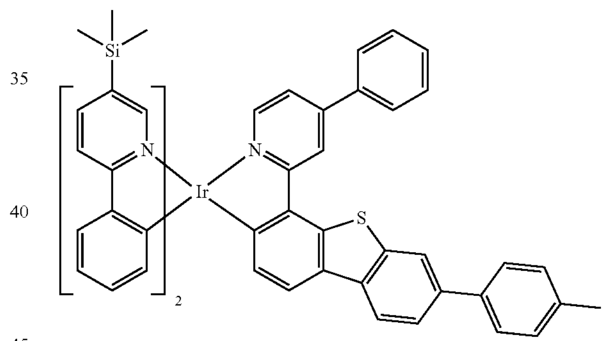
1092
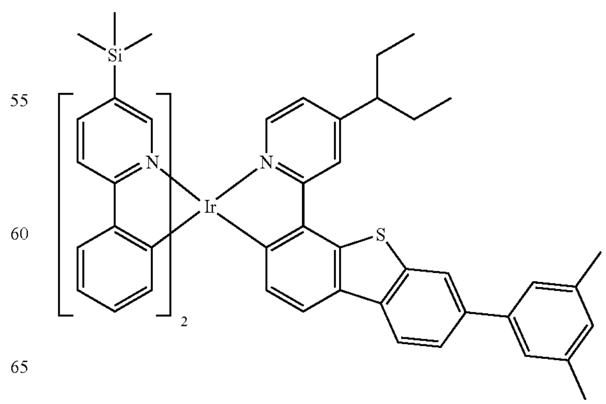

-continued
1093
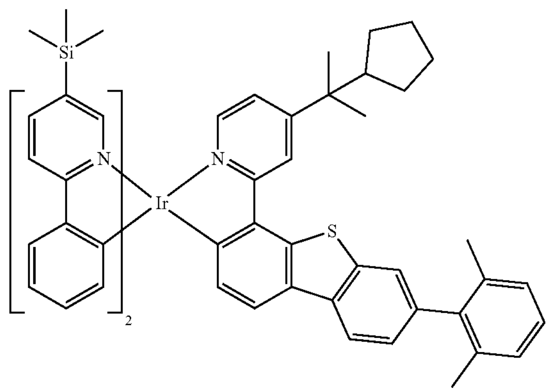
1094
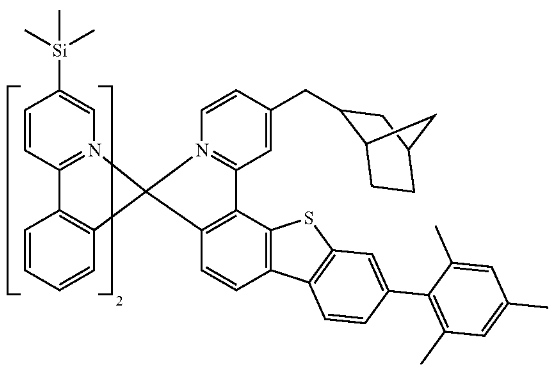
1095
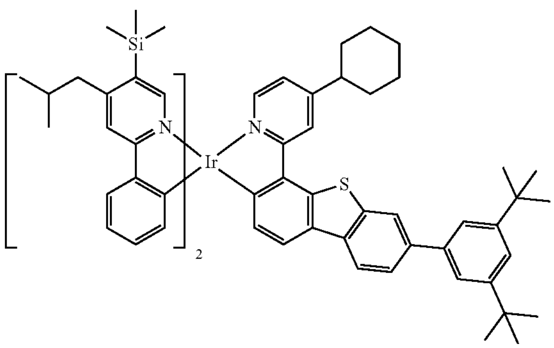
1096
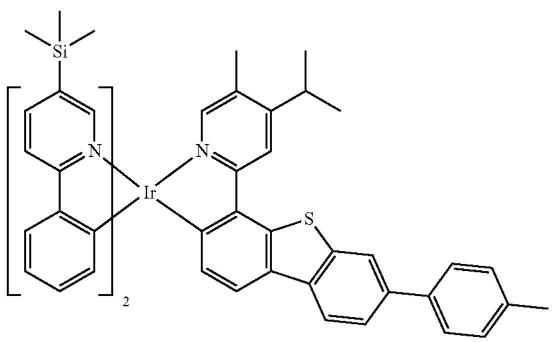
-continued
1097
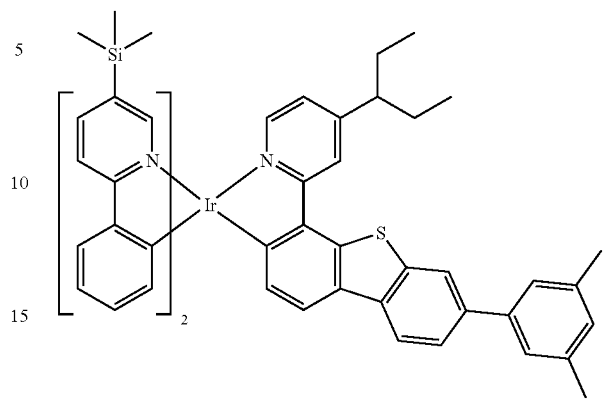
1098
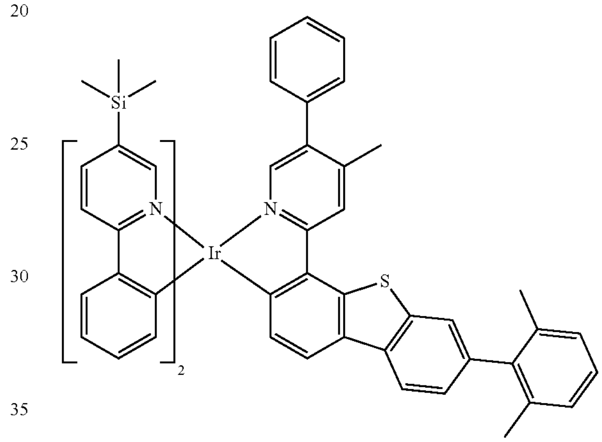
1099
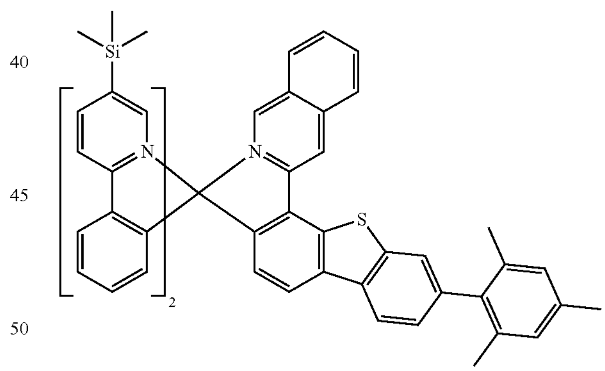
1100
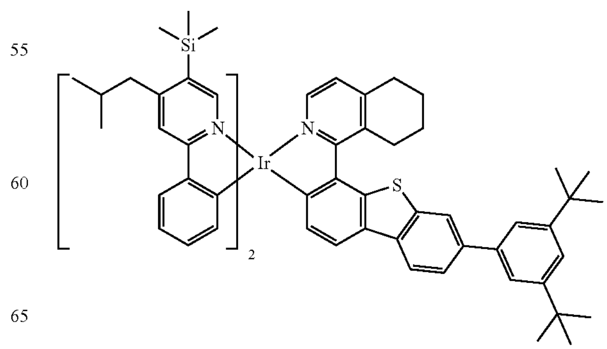

-continued
1101
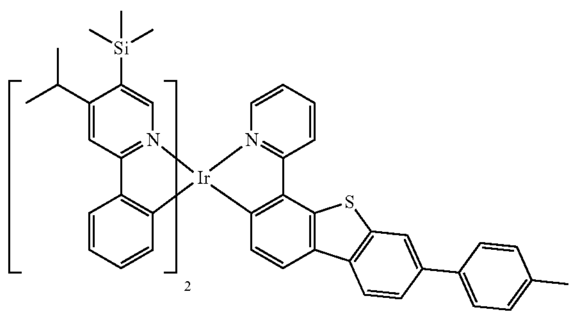
1102
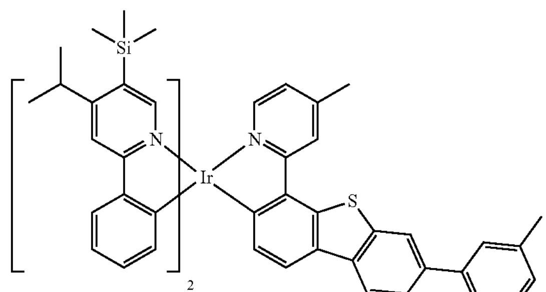
1103
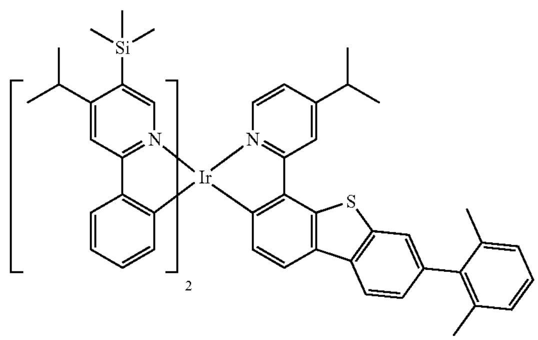
1104
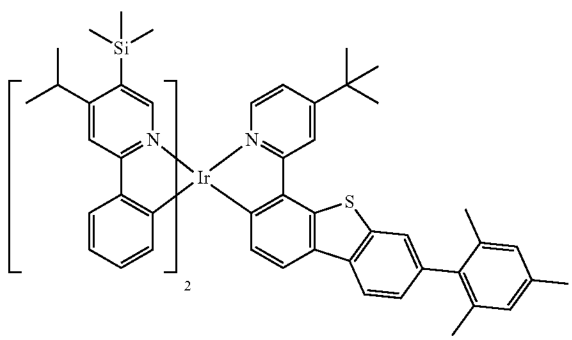
-continued
1105
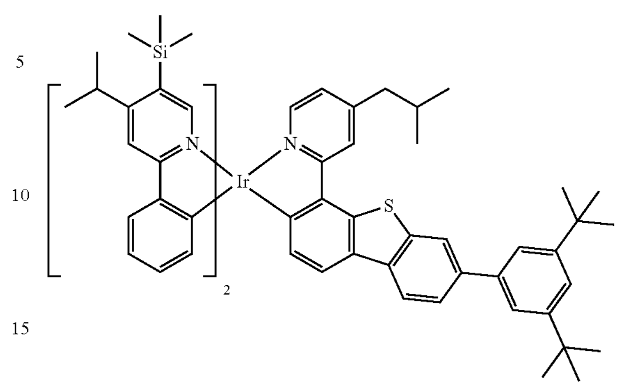
1106
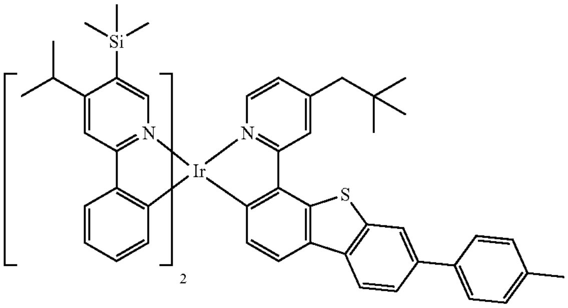
1107
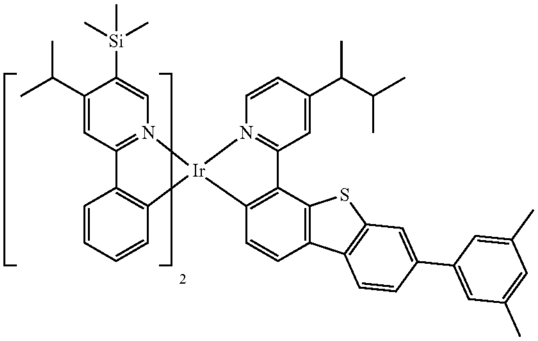
1108
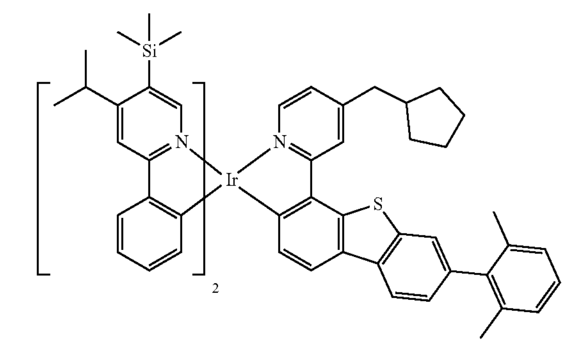

-continued
1109
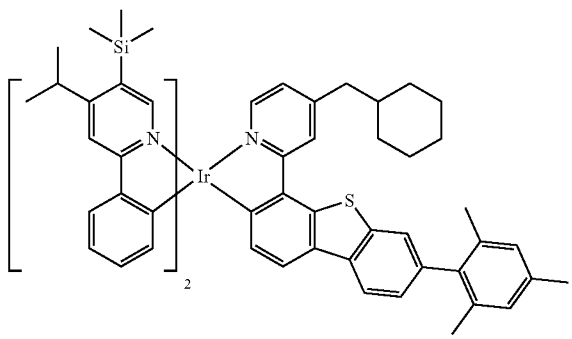
1110
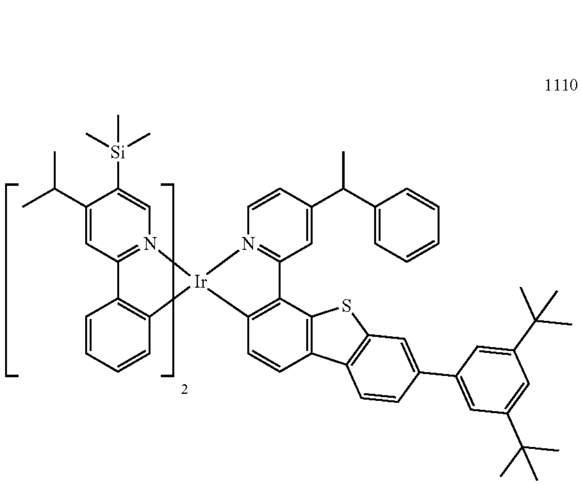
1111
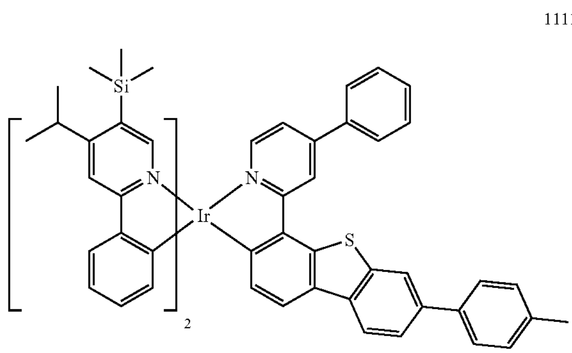
1112
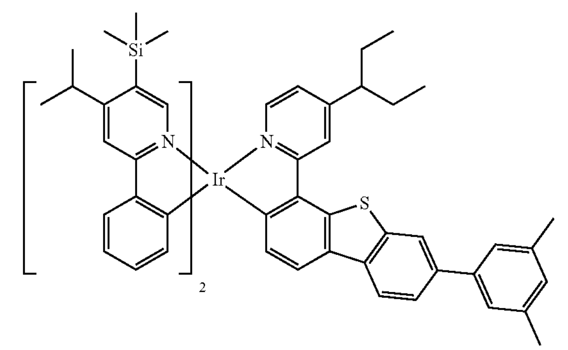
-continued
1113
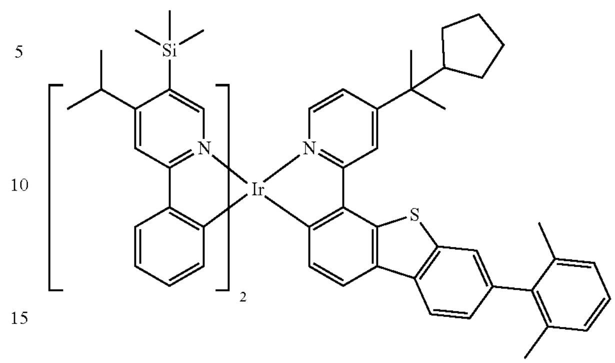
1114
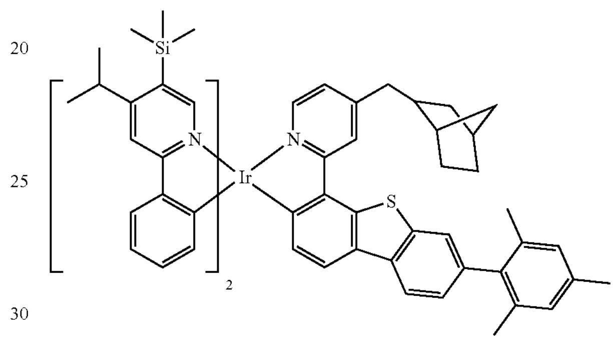
1115
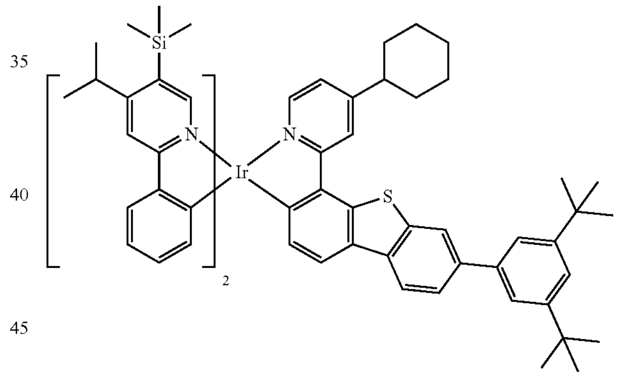
1116
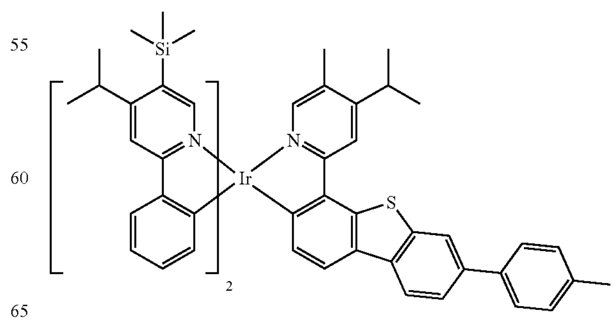

-continued
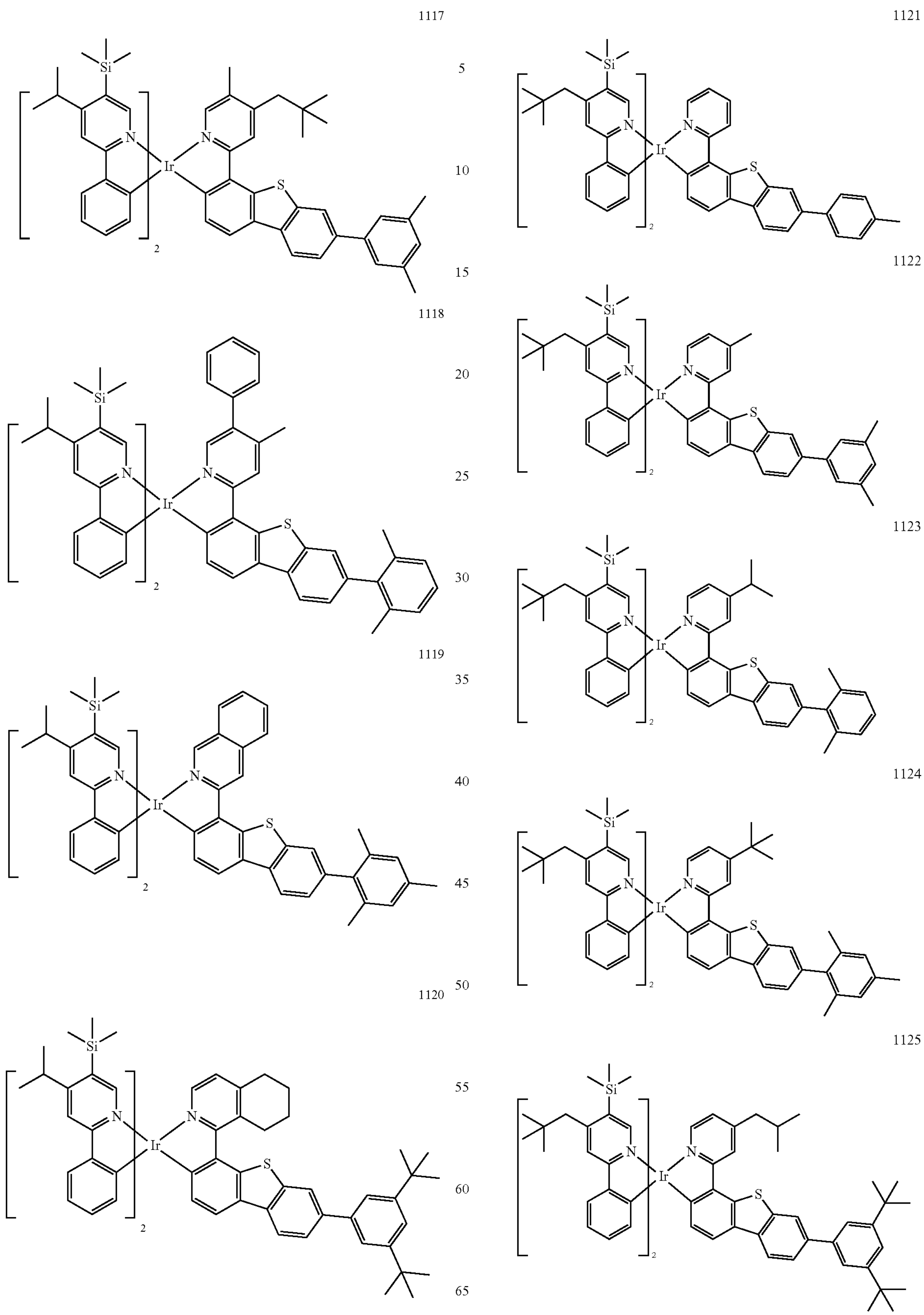
1117
1118
1119
1120
1121
1122
1123
1124
1125

-continued
1126
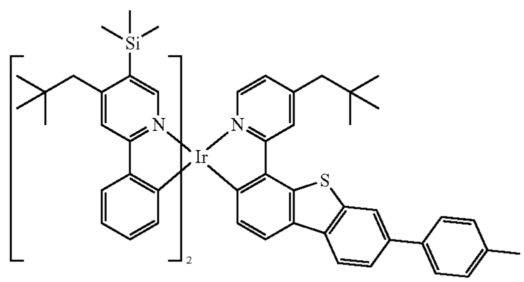
1127
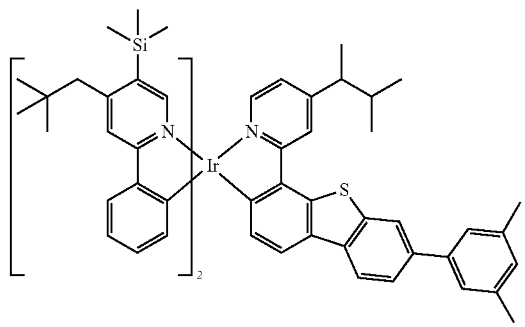
1128
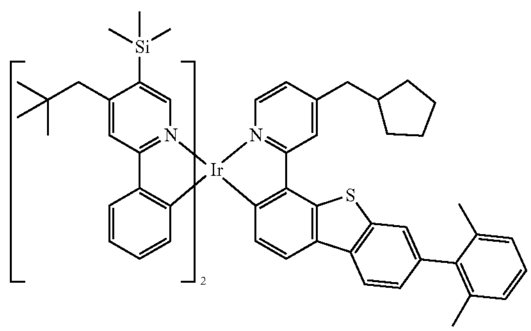
1129
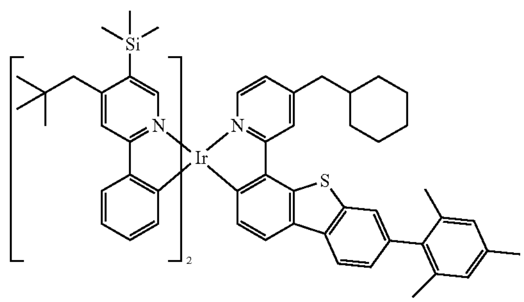
1130
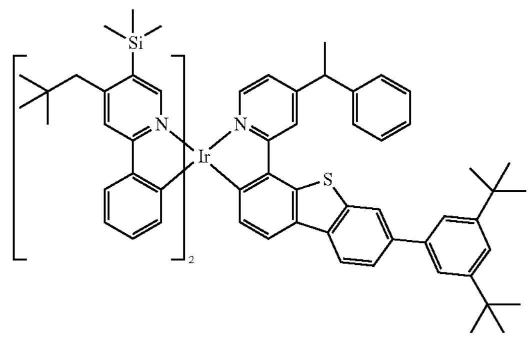
1131
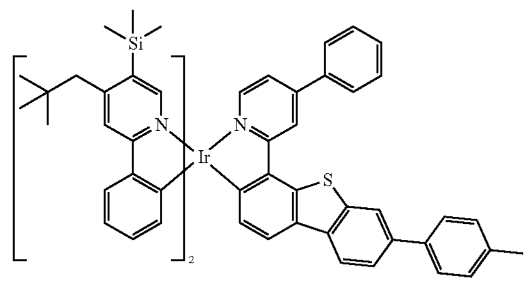
1132
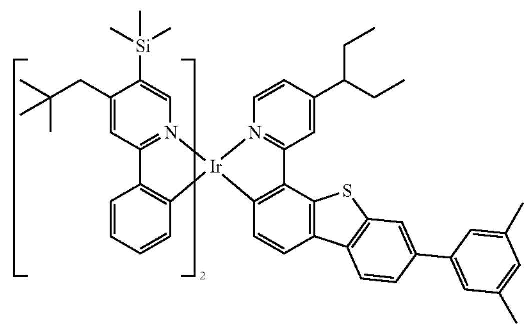
1133
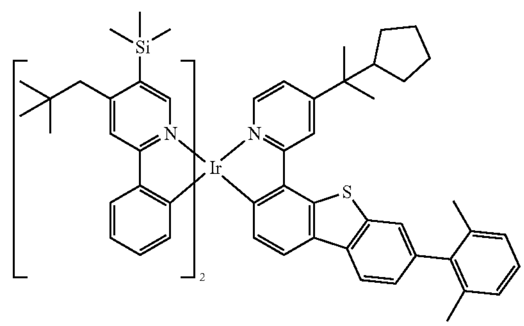

-continued
1134
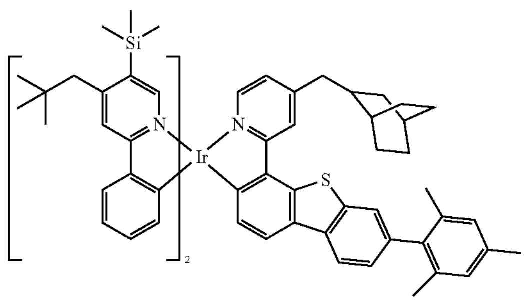
1135
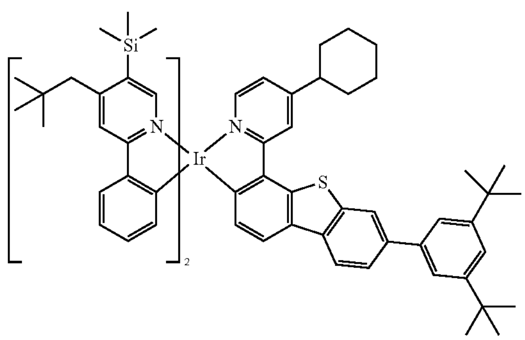
1136
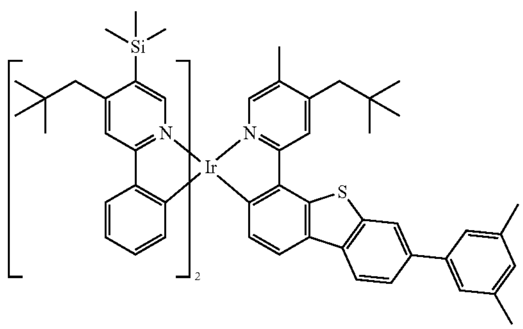
1137
-continued
1138
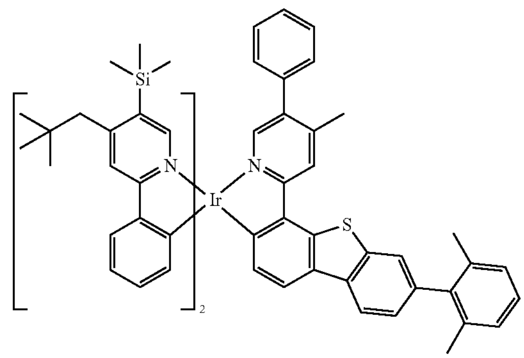
1139
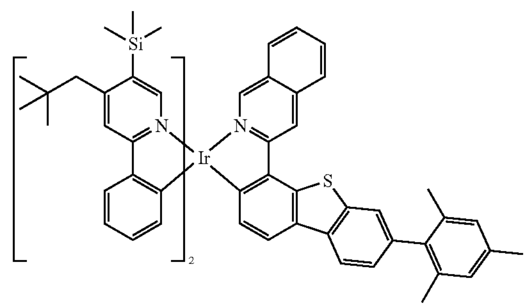
1140
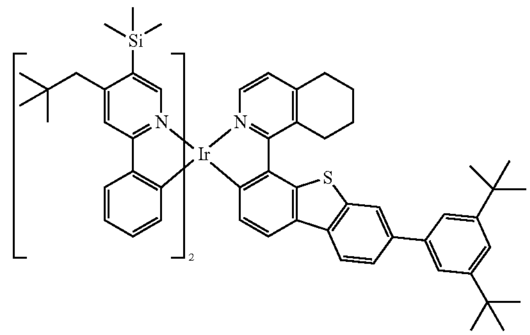
1141
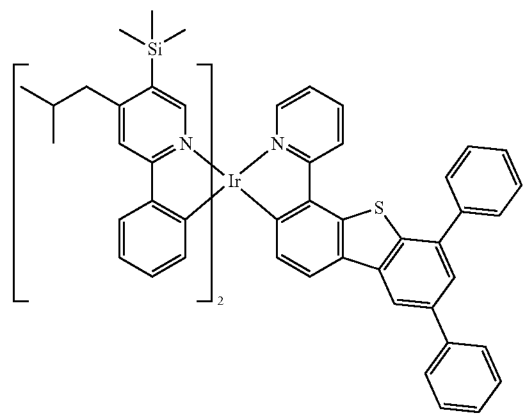

-continued
1142
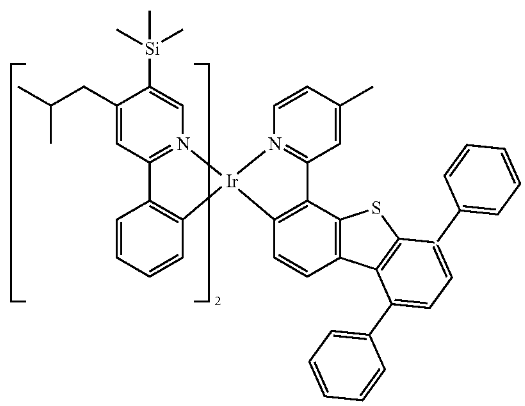
1143
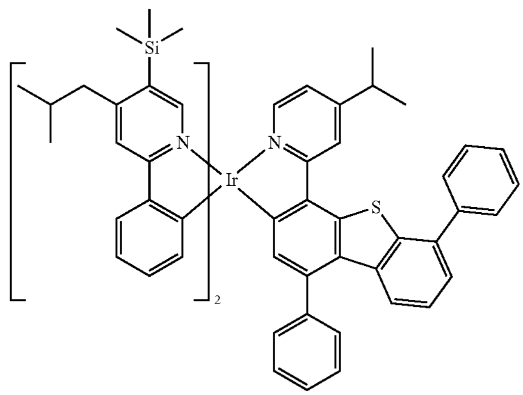
1144
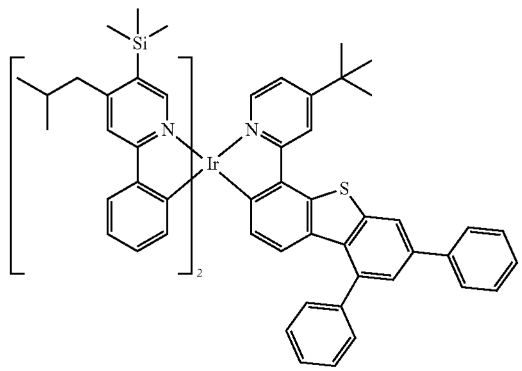
1145
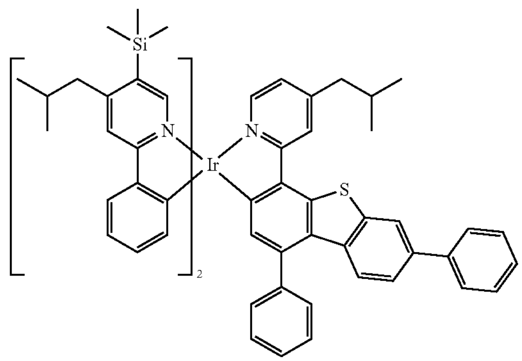
-continued
1146
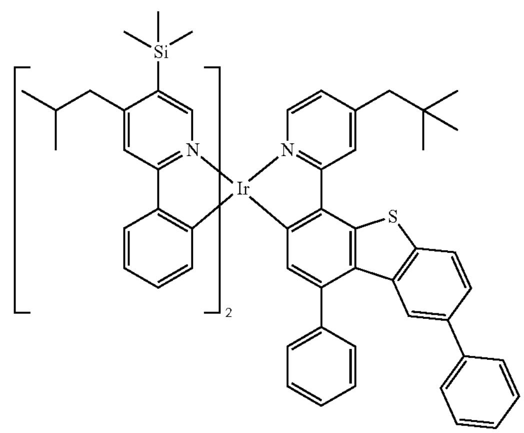
1147
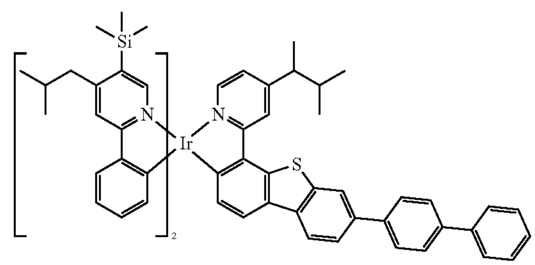
1148
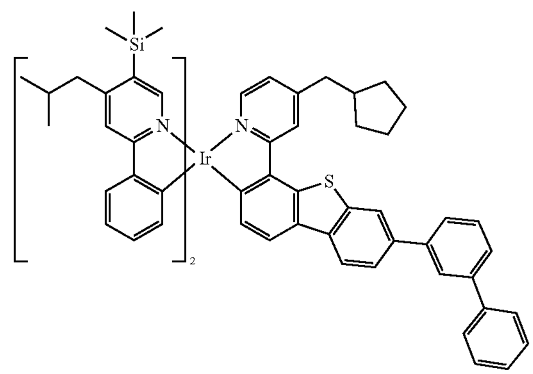
1149
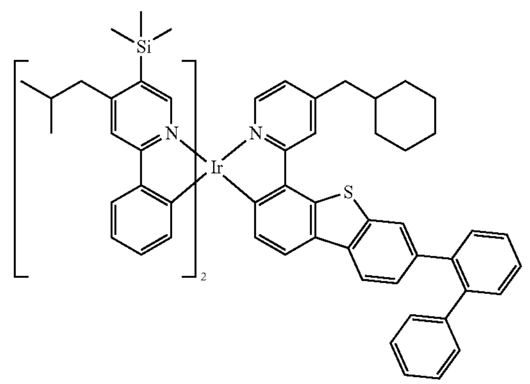

-continued
1150
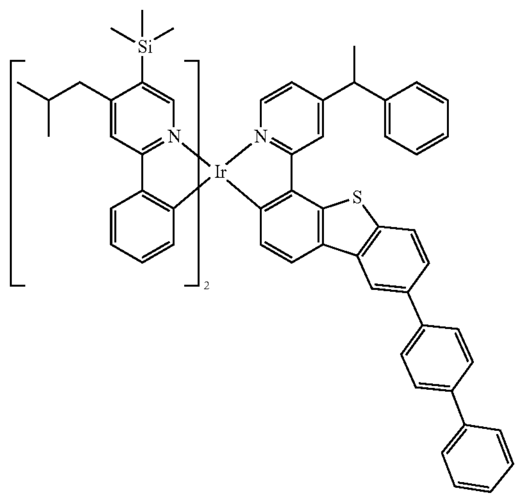
1151
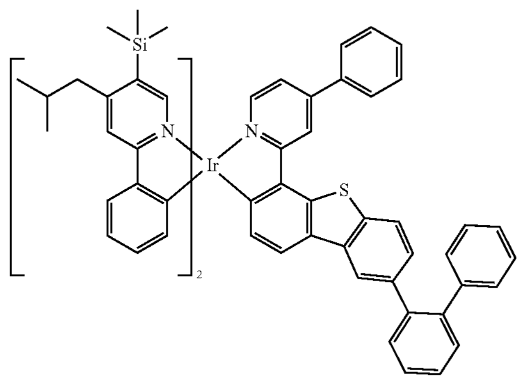
1152
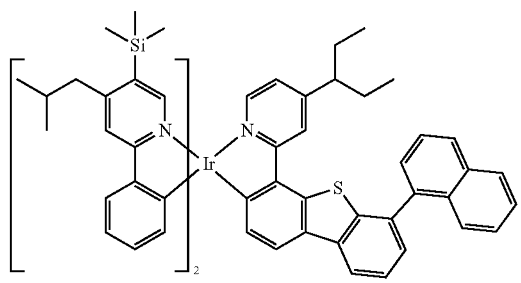
1153
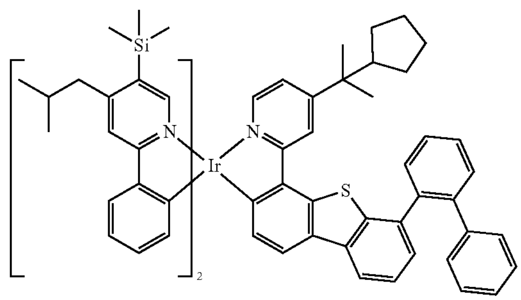
-continued
1154
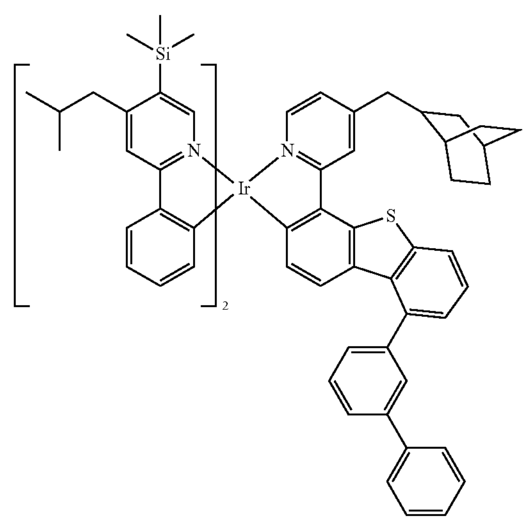
1155
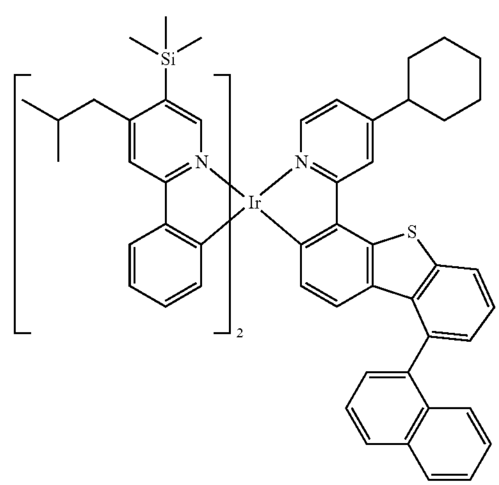
1156
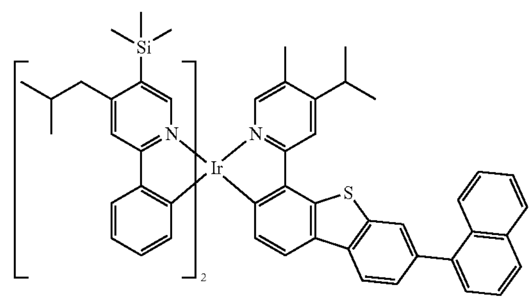
1157
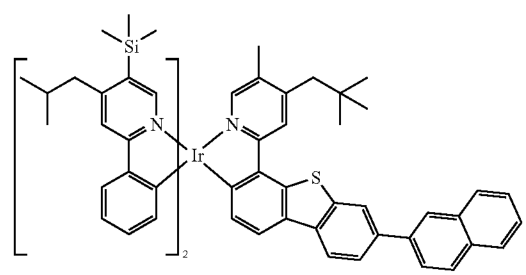

-continued
1158
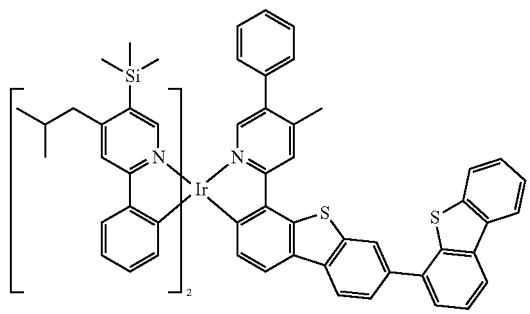
1159
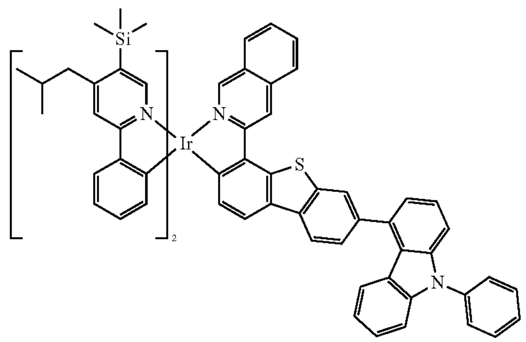
1160
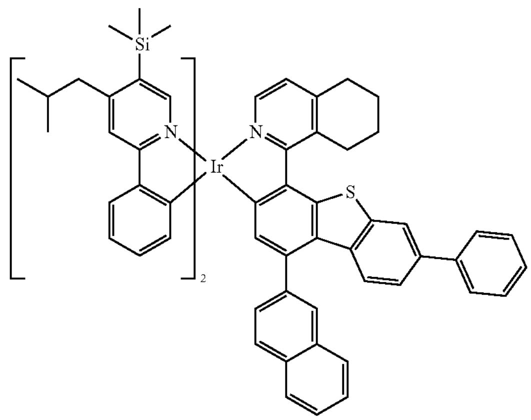
1161
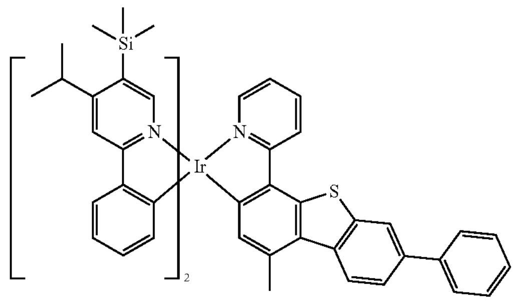
-continued
1162
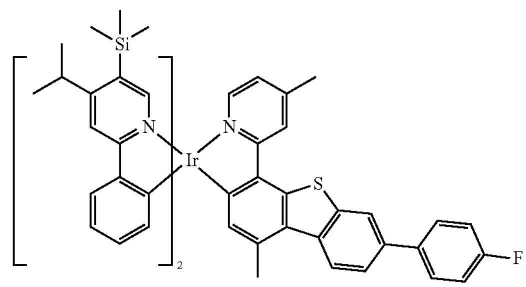
1163
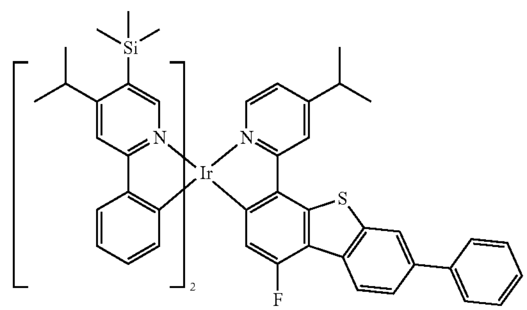
1164
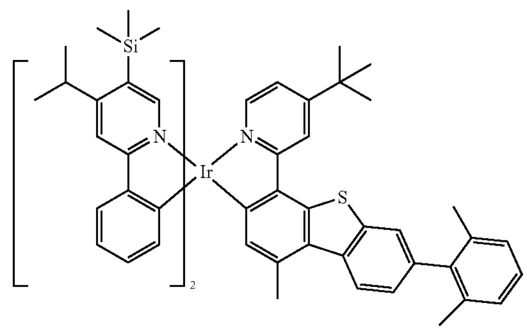
1165
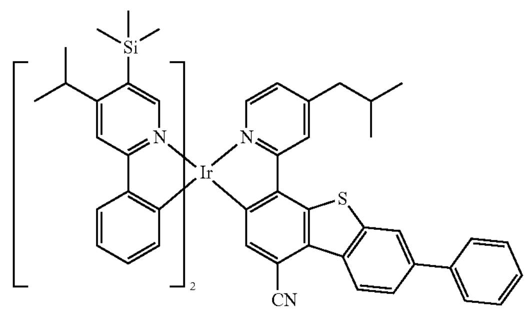

-continued
1166
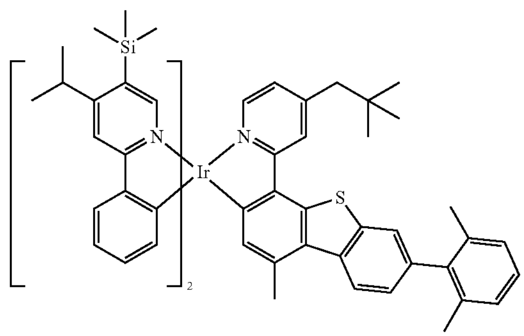
1167
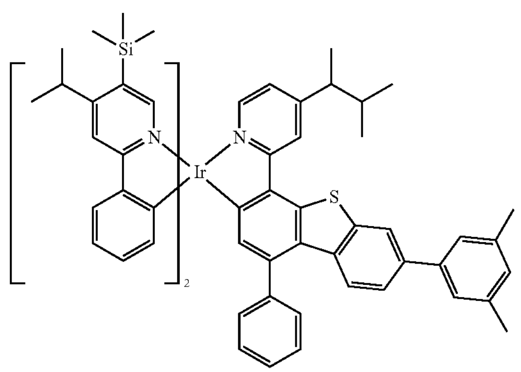
1168
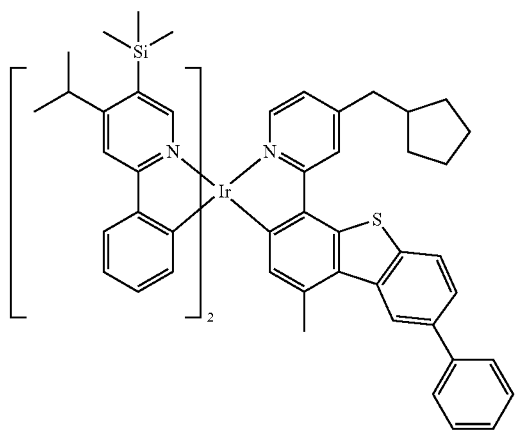
1169
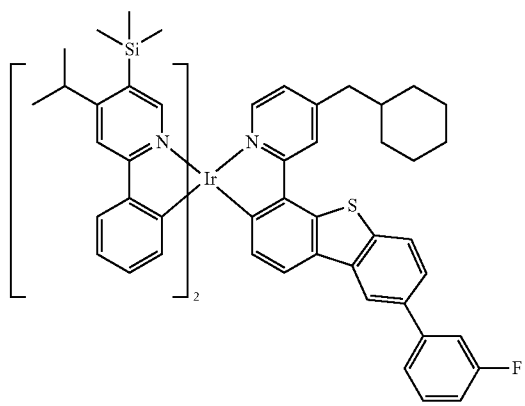
-continued
1170
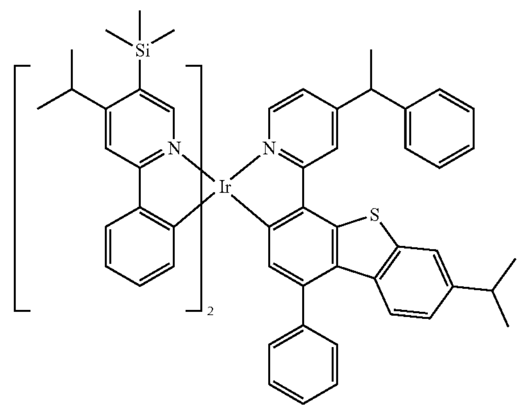
1171
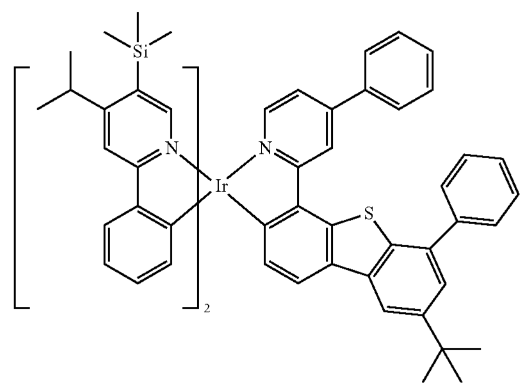
1172
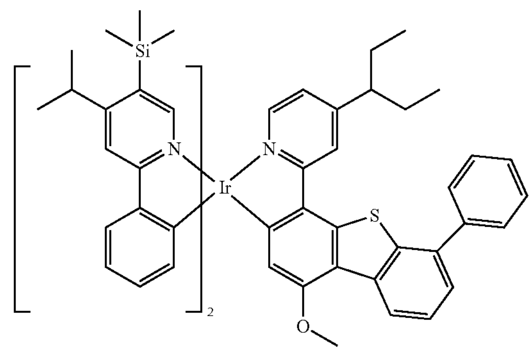
1173
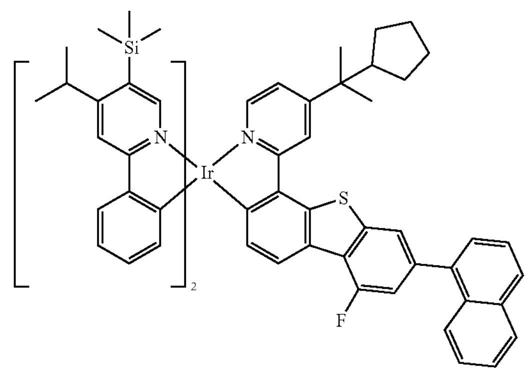

-continued
1174
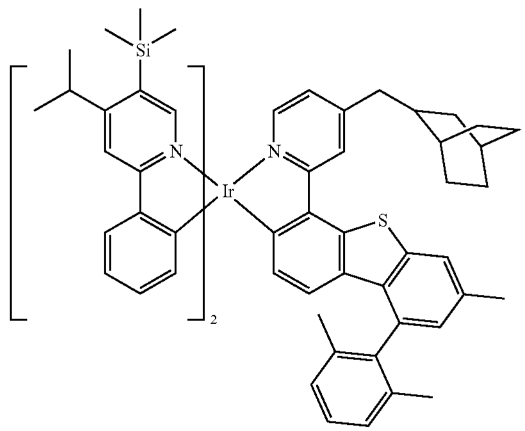
1175
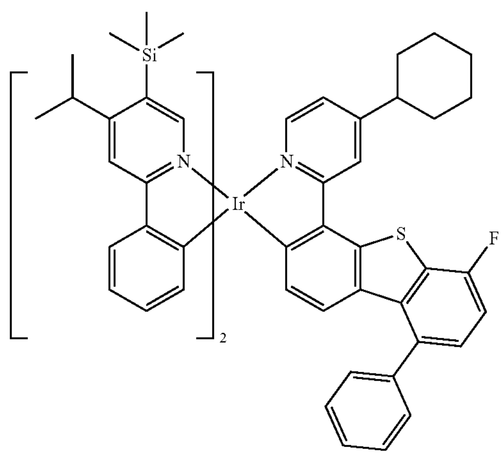
1176
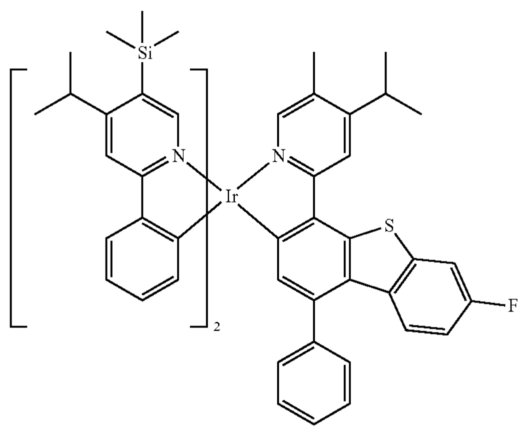
-continued
1177
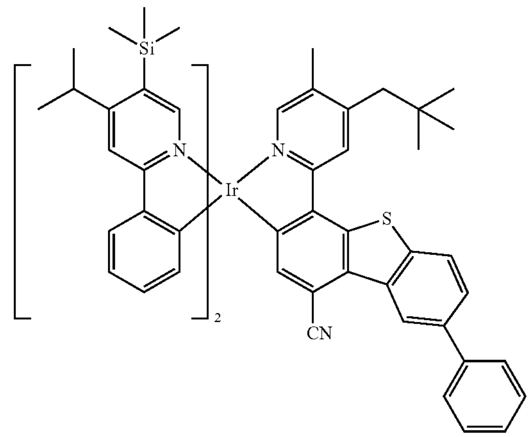
1178
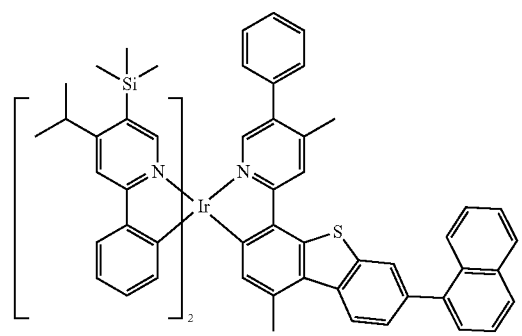
1179
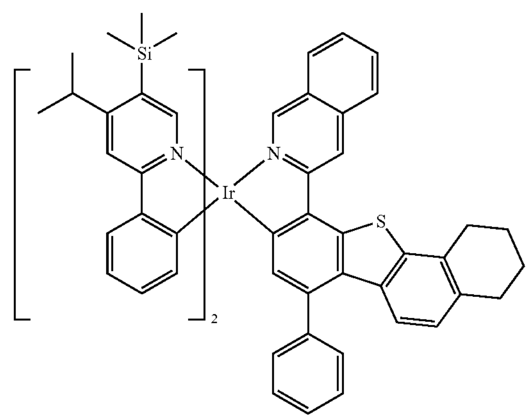

-continued
1180
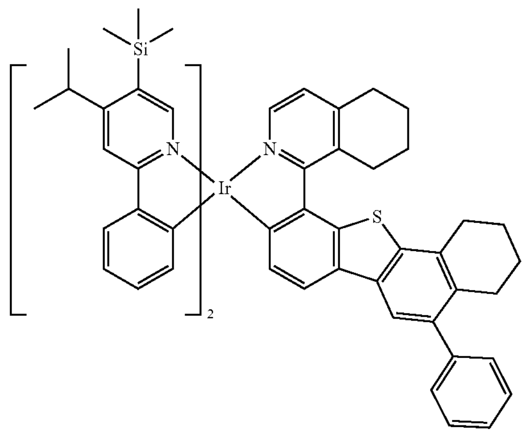
1181
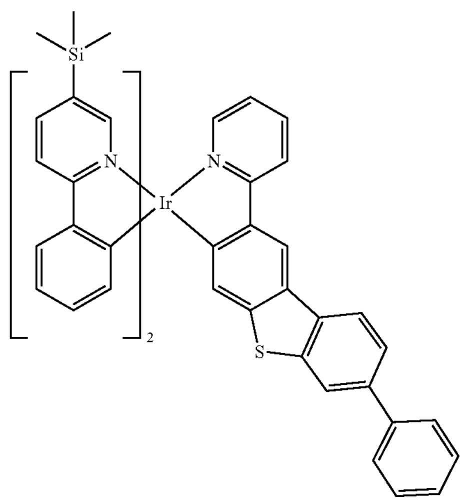
1182
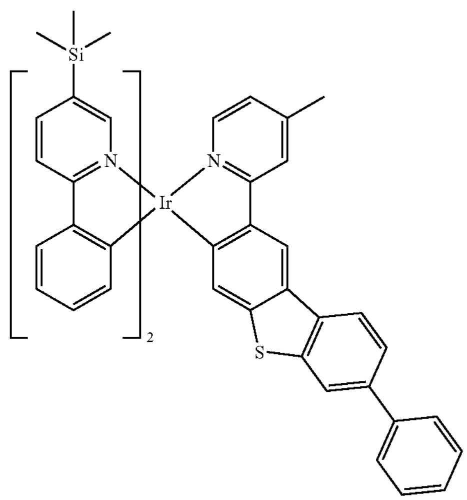
-continued
1183
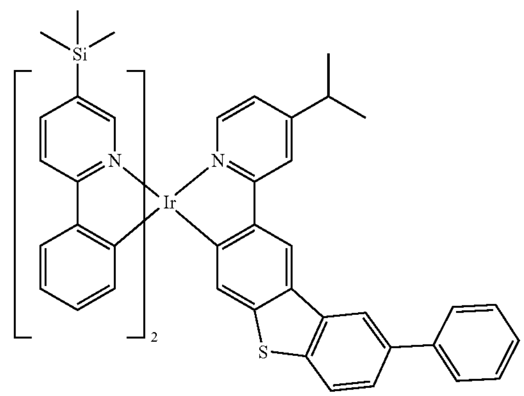
1184
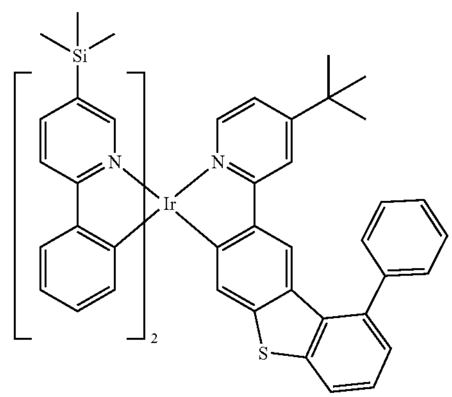
1185
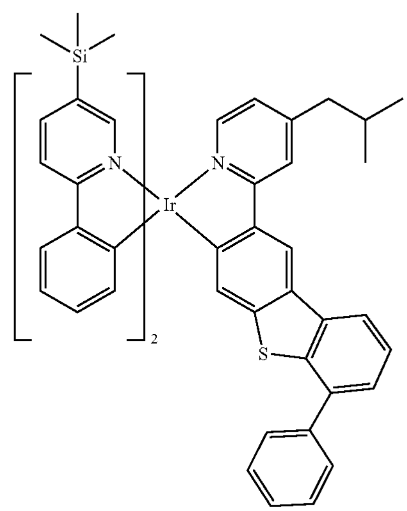

-continued
1186
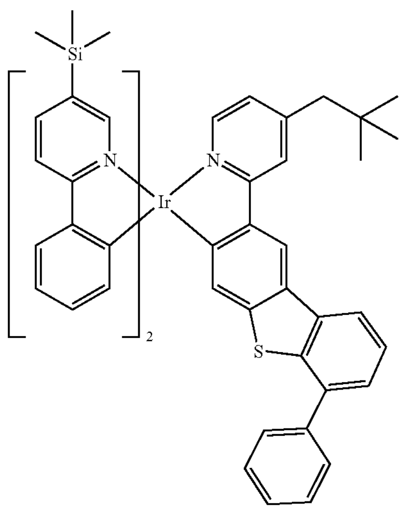
1187
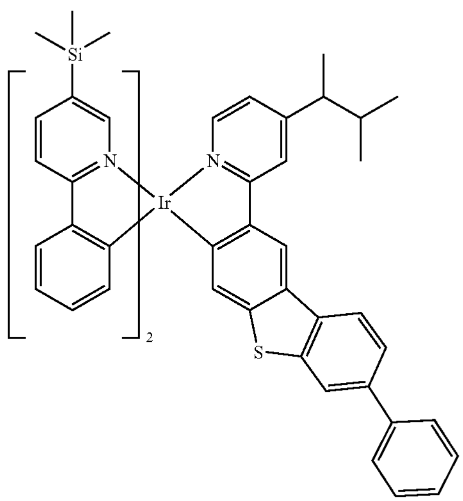
1188
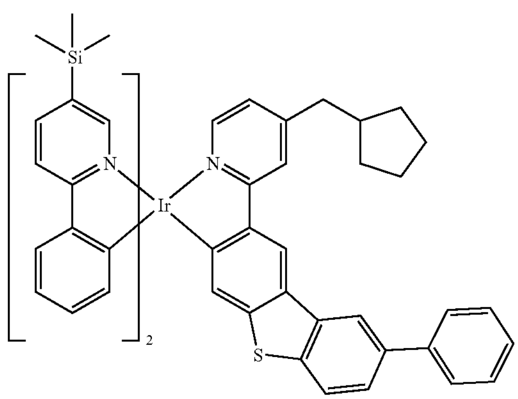
-continued
1189
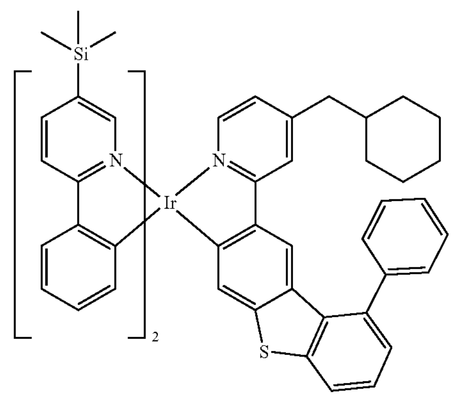
1190
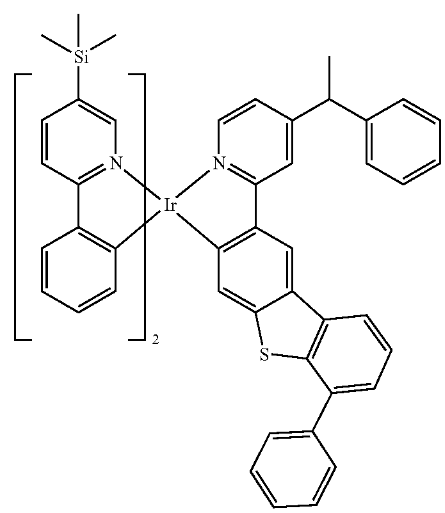
1191
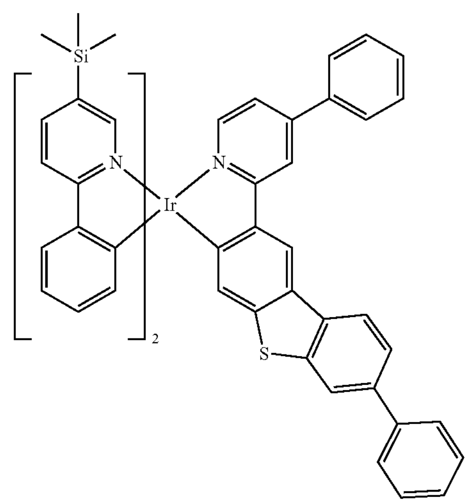

1192
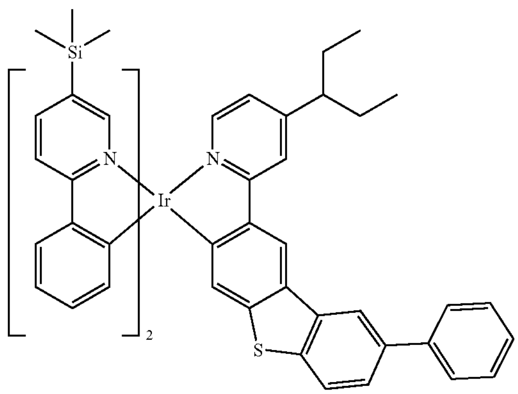
1193
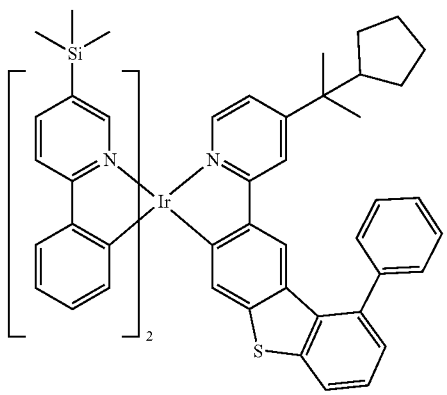
1194
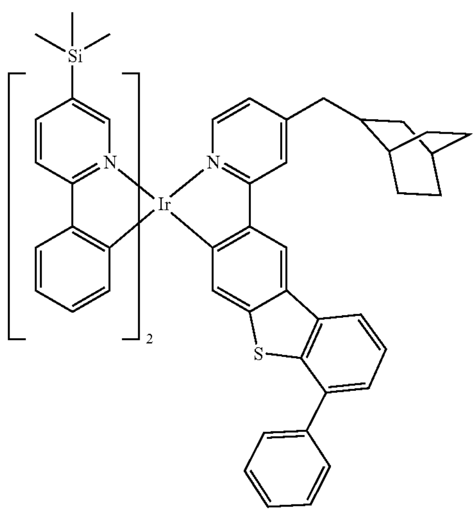
1195
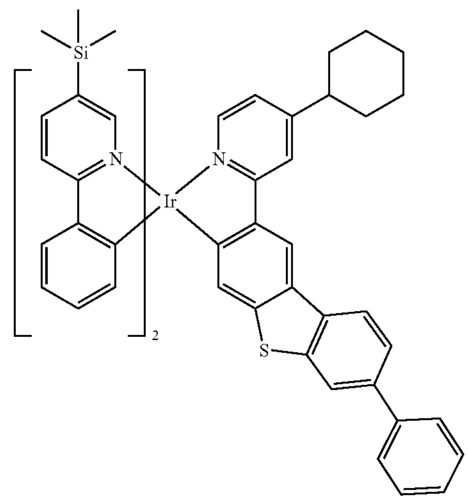
1196
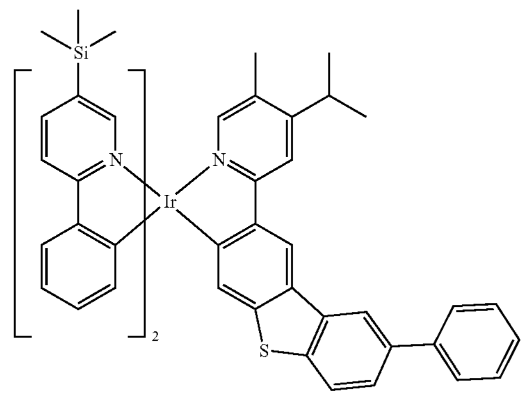
1197
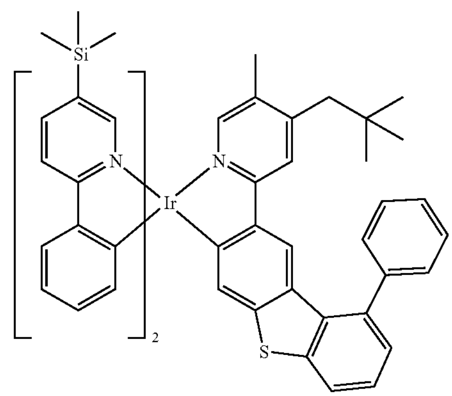

-continued
1198
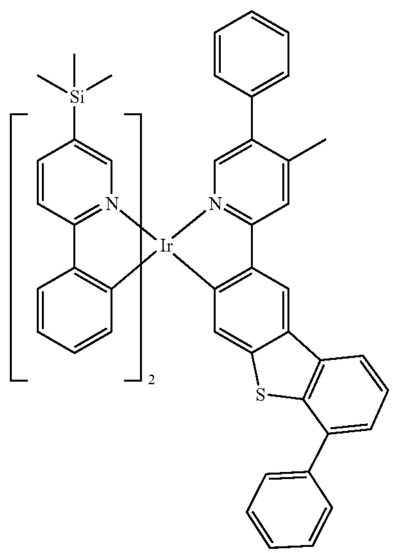
1199
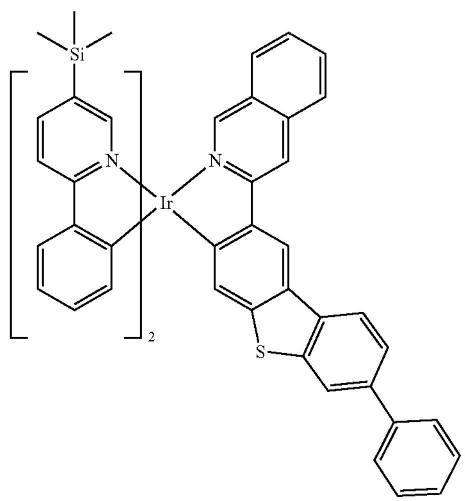
1200
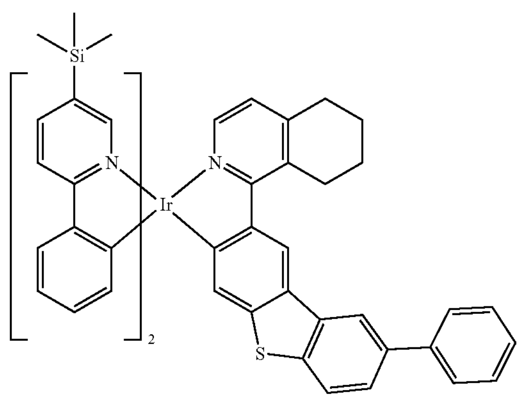
-continued
1201
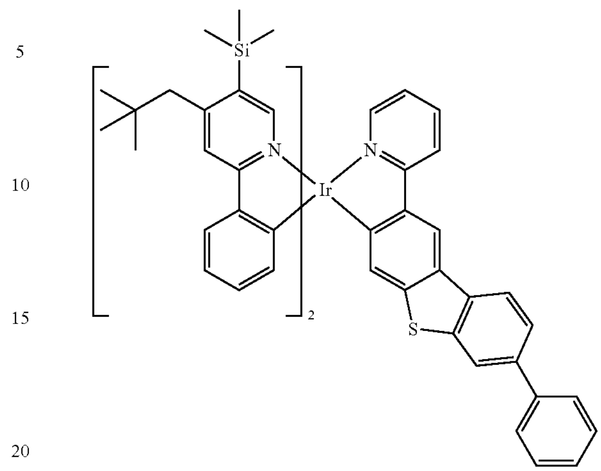
1202
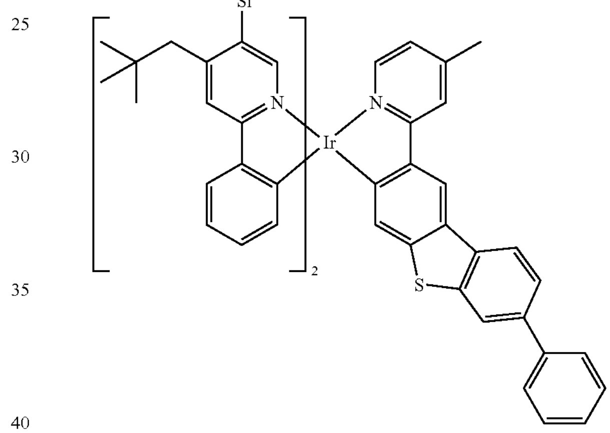
1203
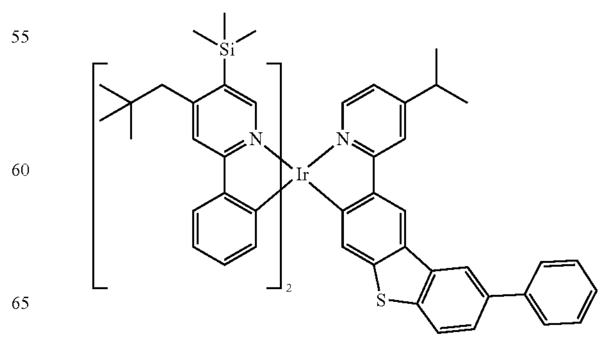

-continued
1204
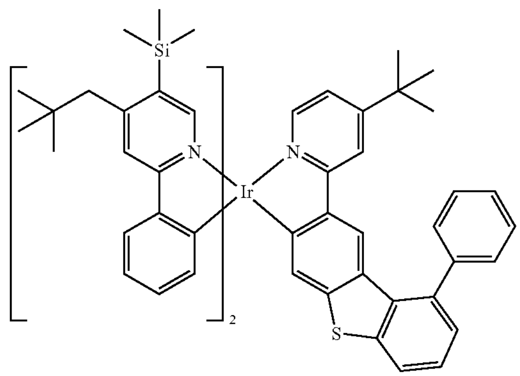
1205
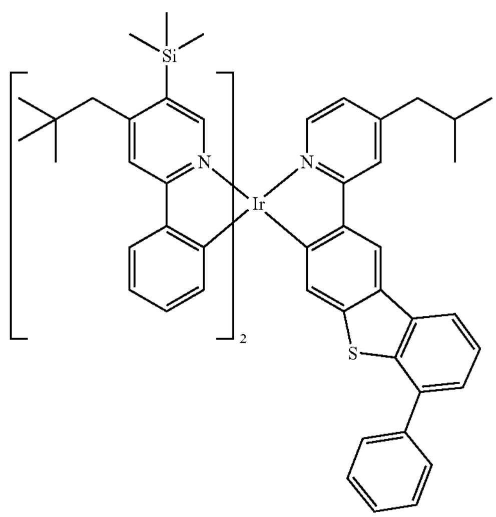
1206
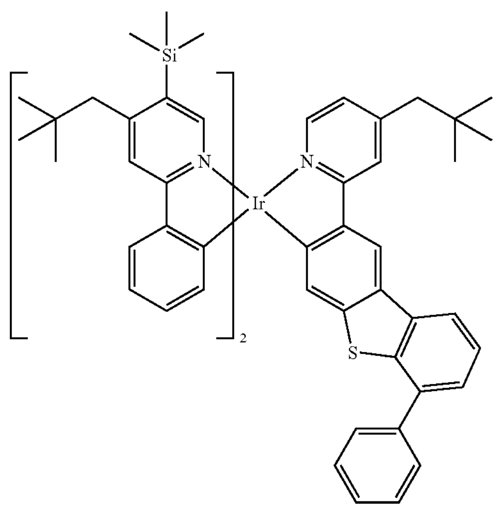
-continued
1207
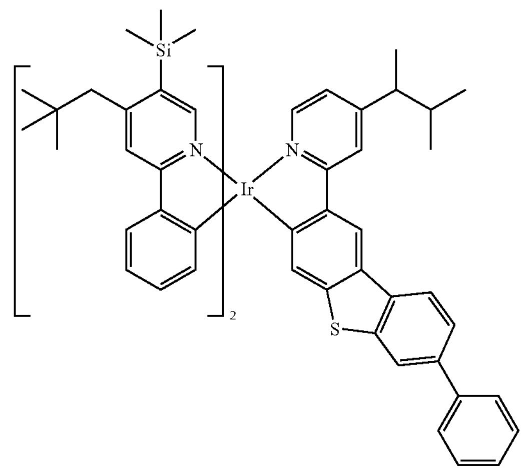
1208
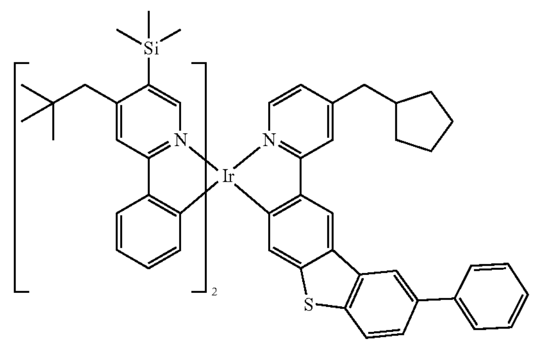
1209
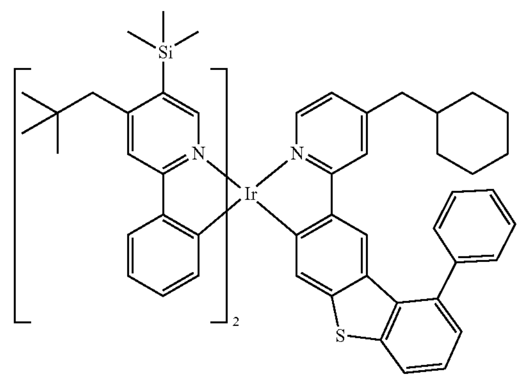

1210
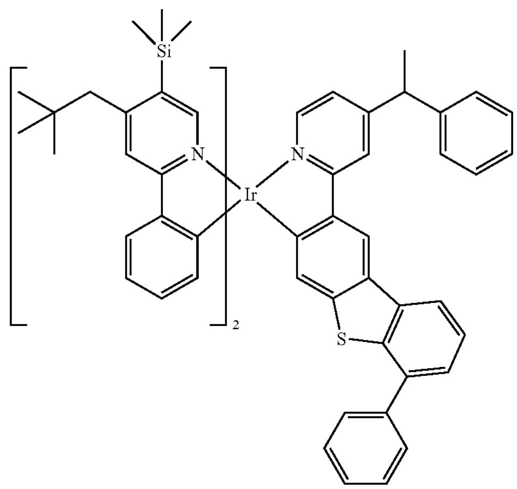
1211
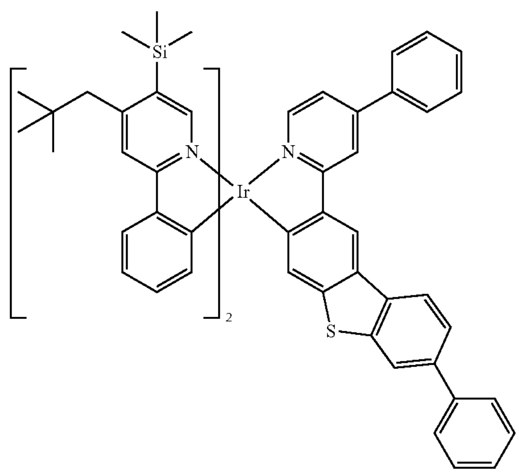
1212
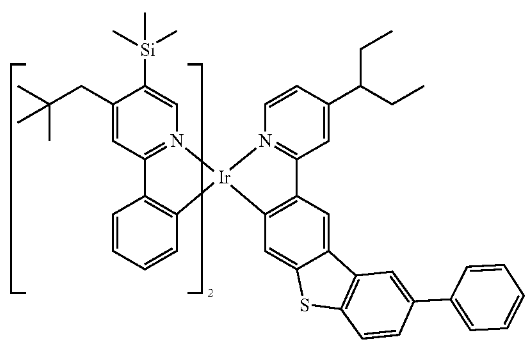
1213
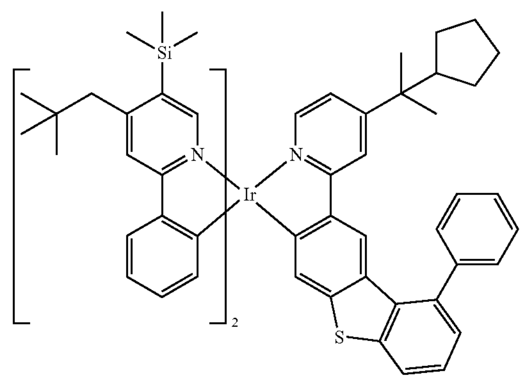
1214
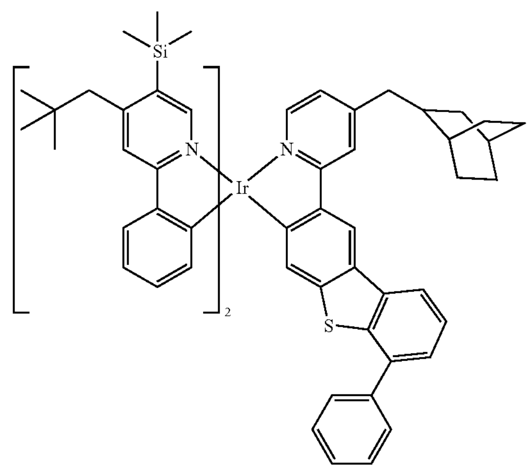
1215
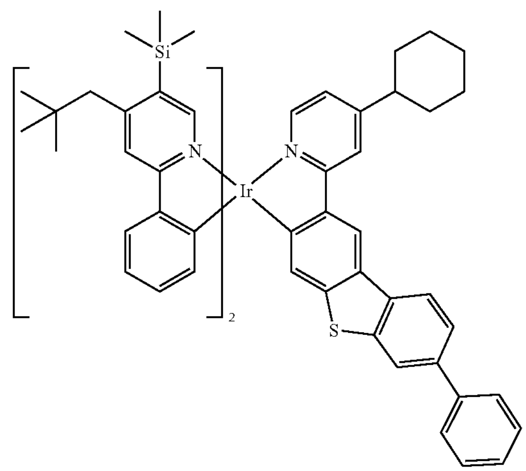

-continued
1216
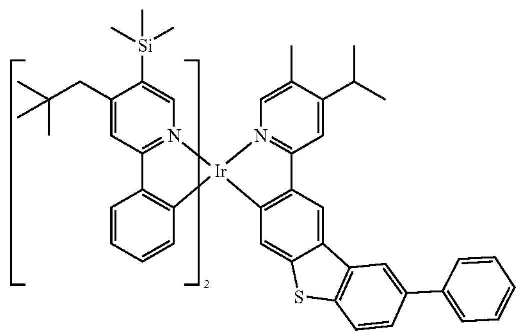
1217
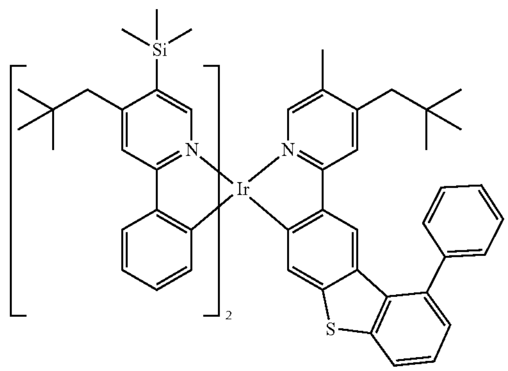
1218
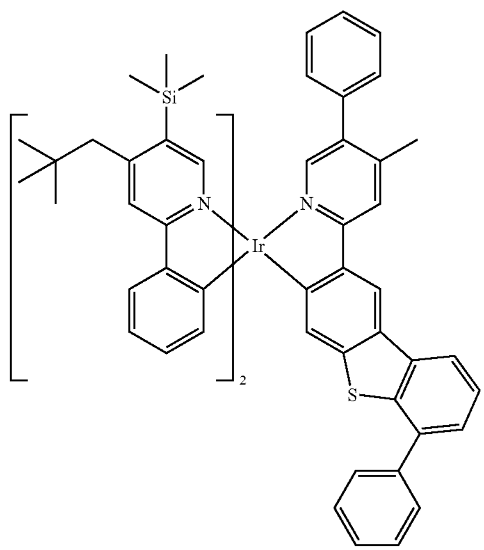
-continued
1219
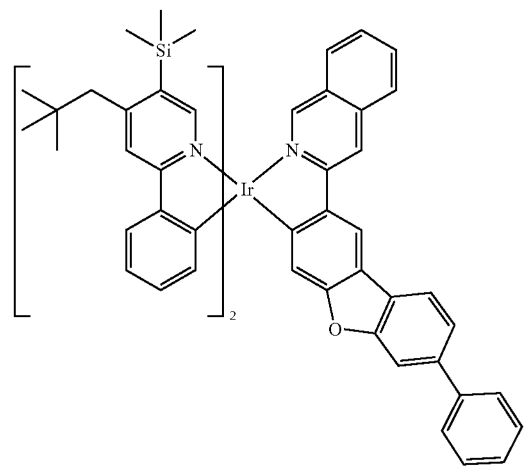
1220
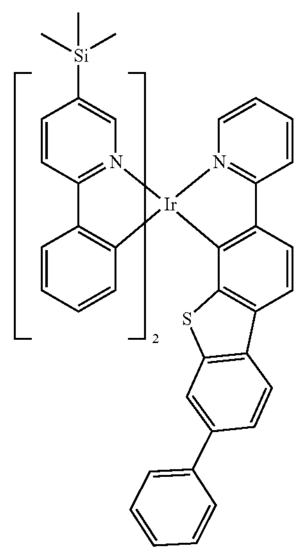
1221
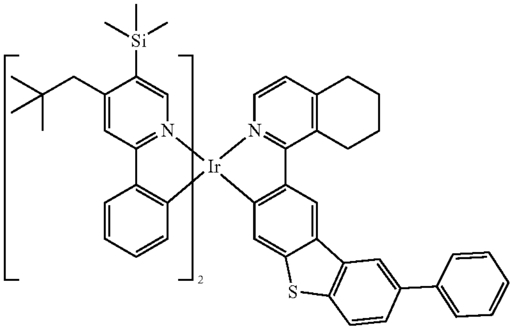

1222
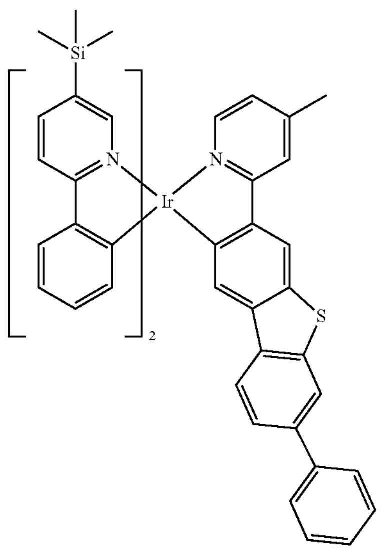
1223
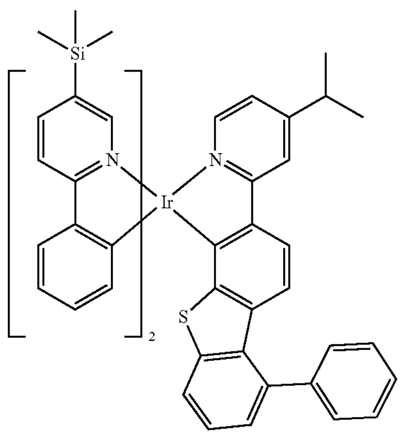
1224
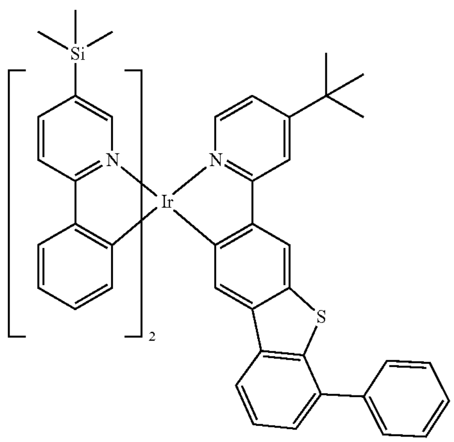
1225
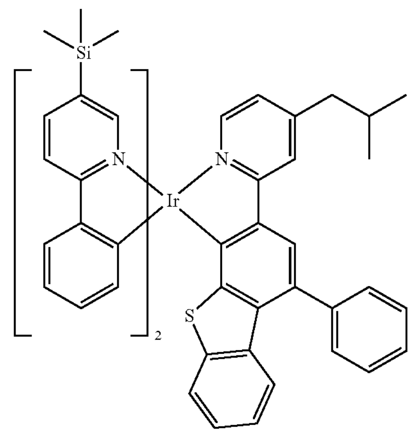
1226
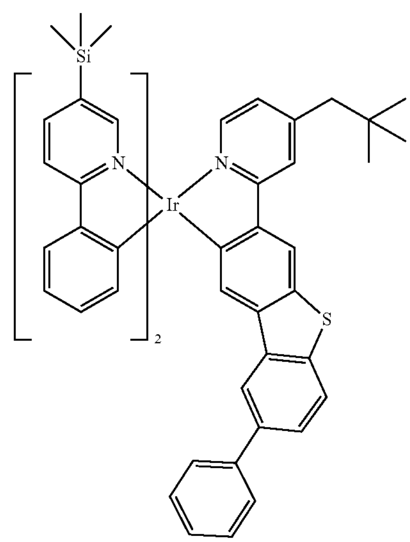
1227
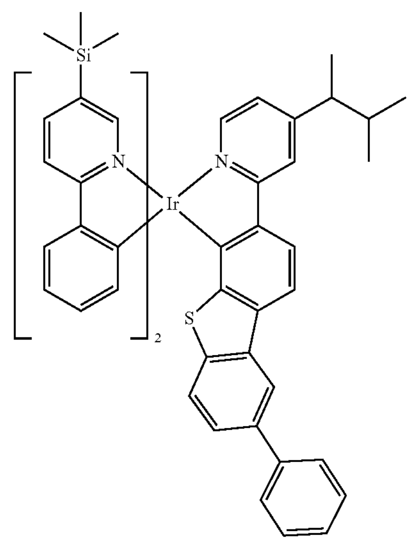

-continued
1228
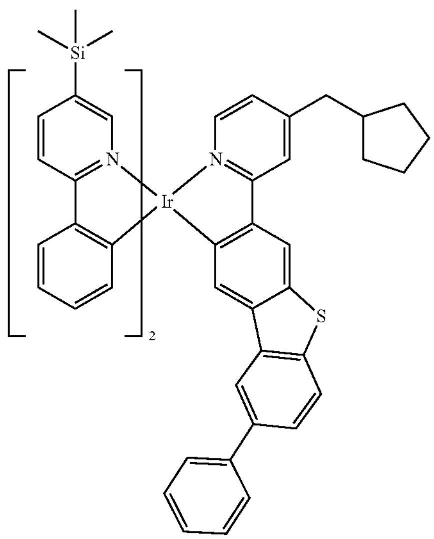
1229
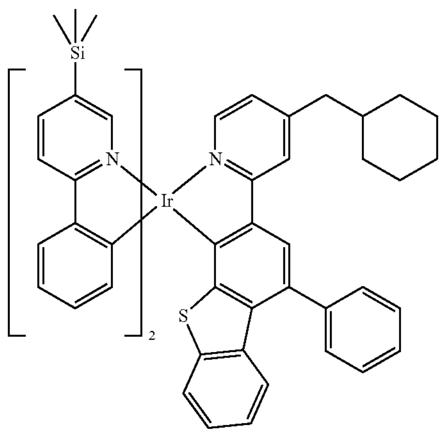
1230
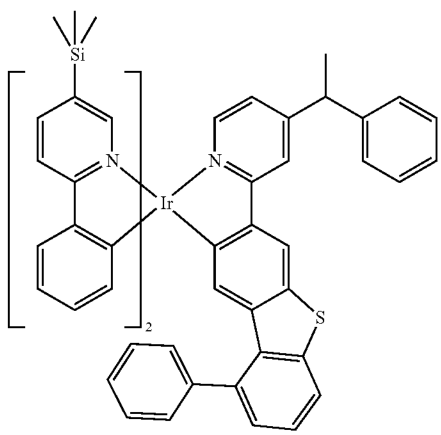
-continued
1231
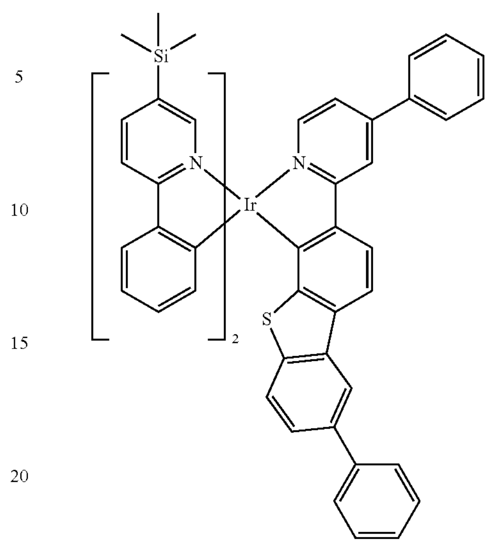
1232
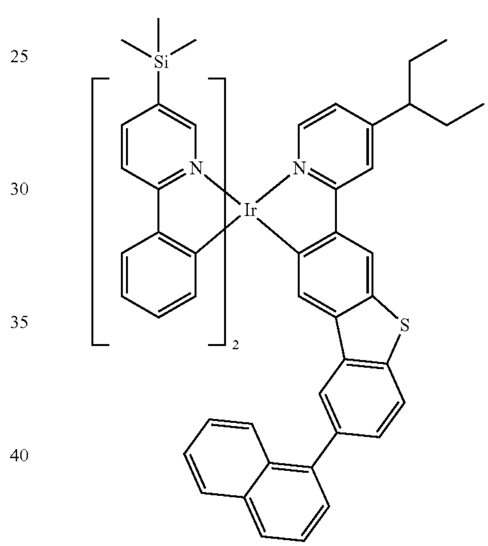
1233
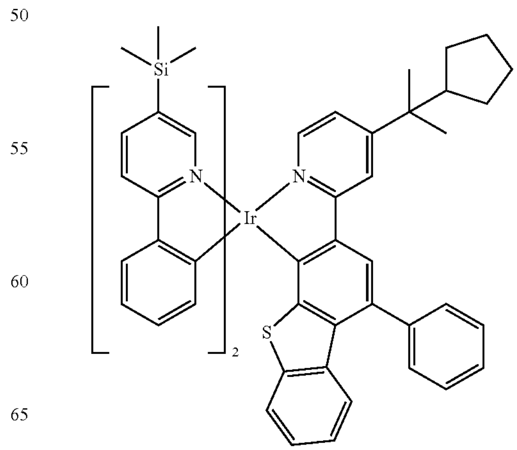

-continued
1234
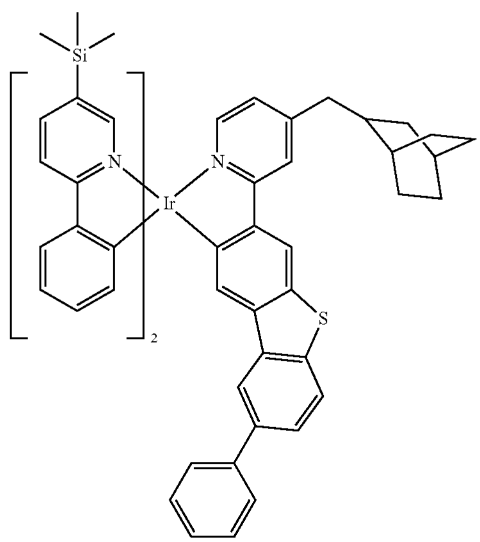
1235
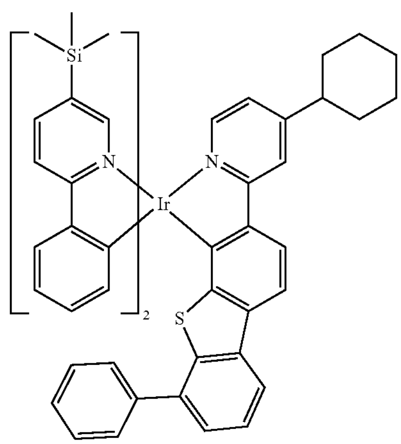
1236
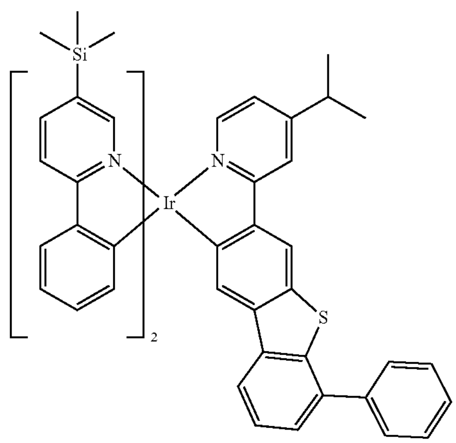
-continued
1237
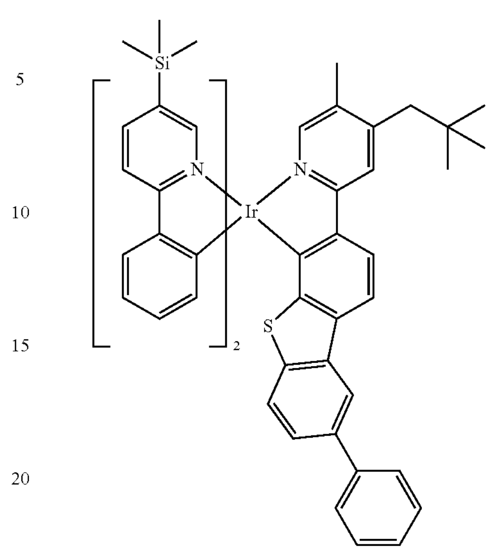
1238
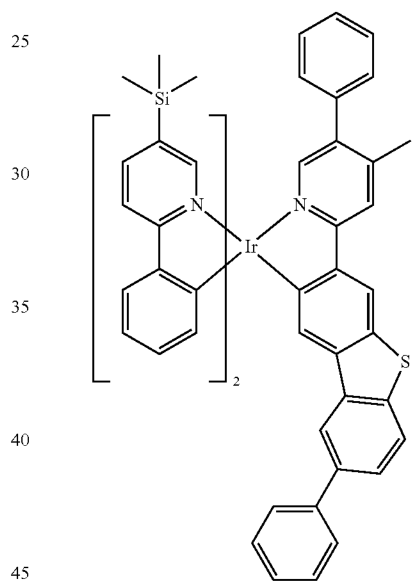
1239
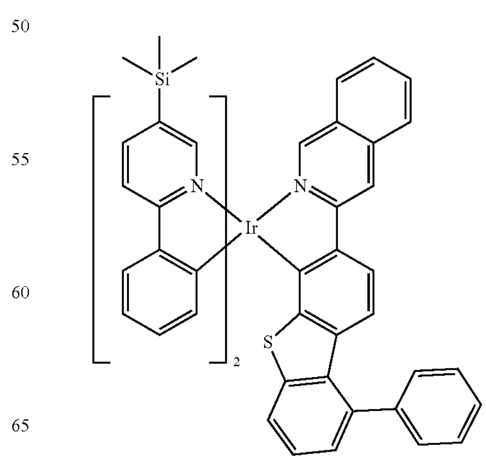

-continued
1240
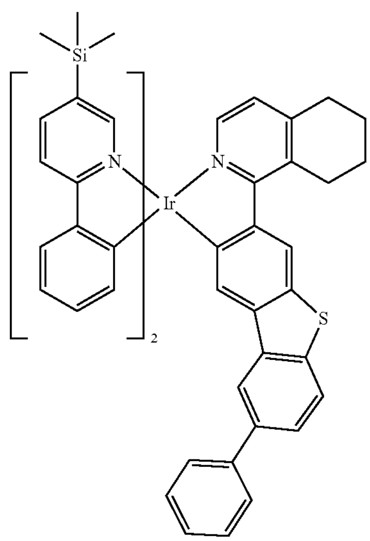
1241
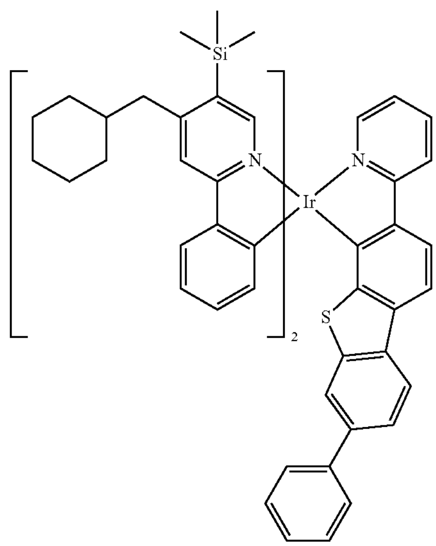
1242
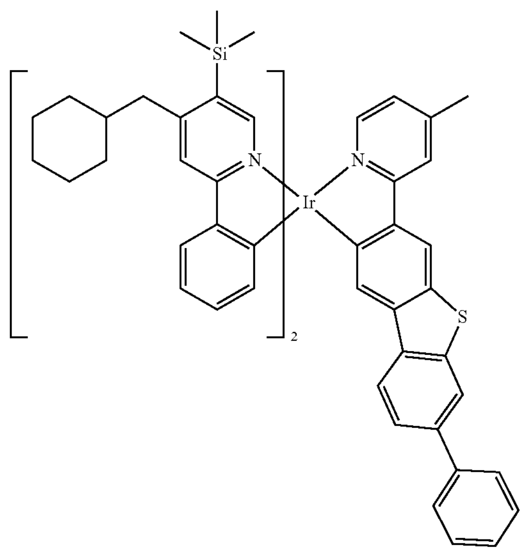
-continued
1243
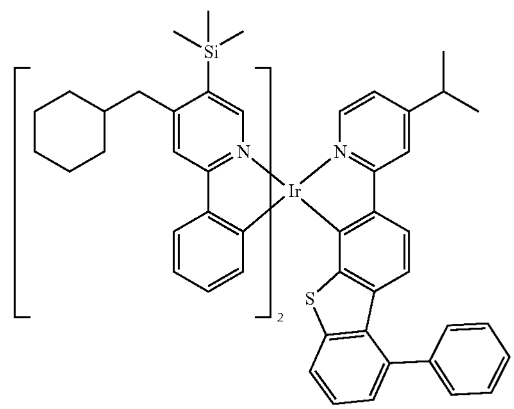
1244
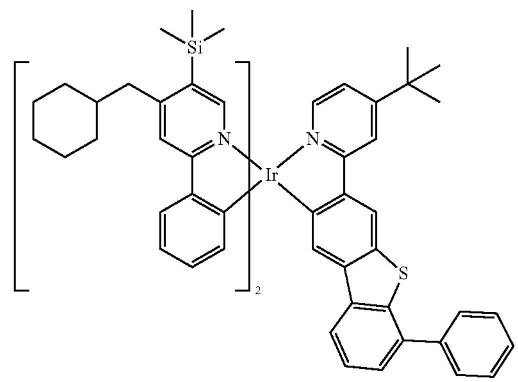
1245
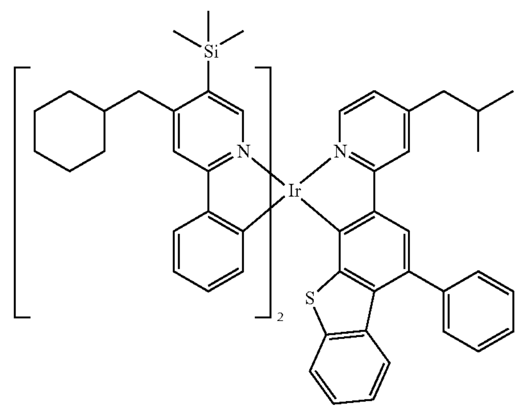

-continued
1246
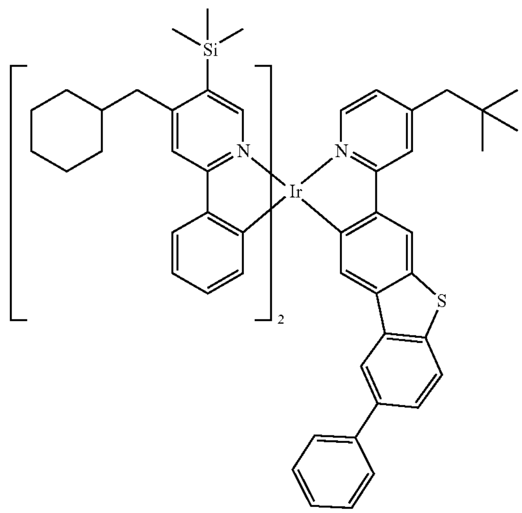
1247
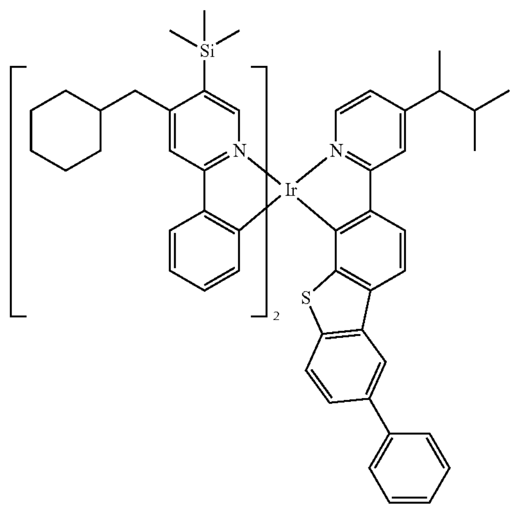
1248
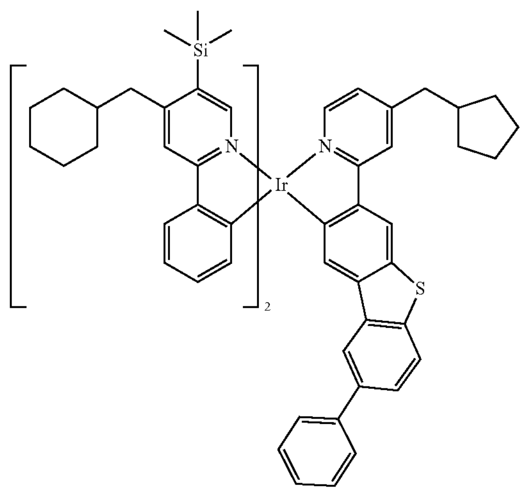
-continued
1249
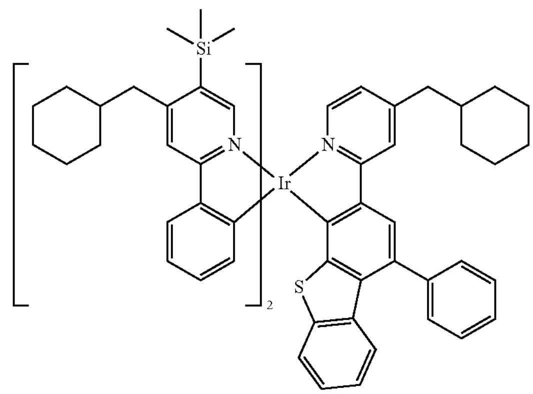
1250
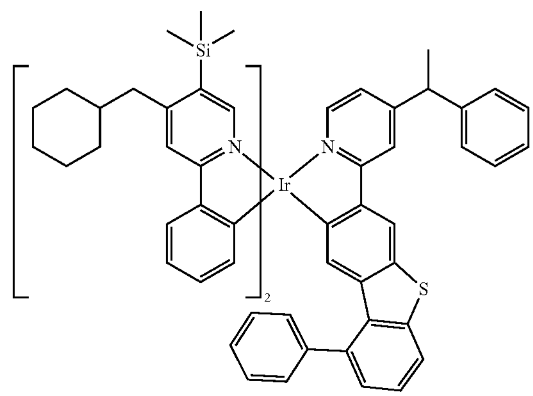
1251
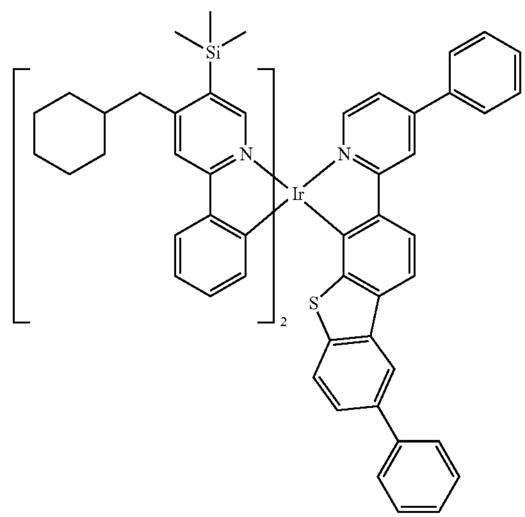

-continued
1252
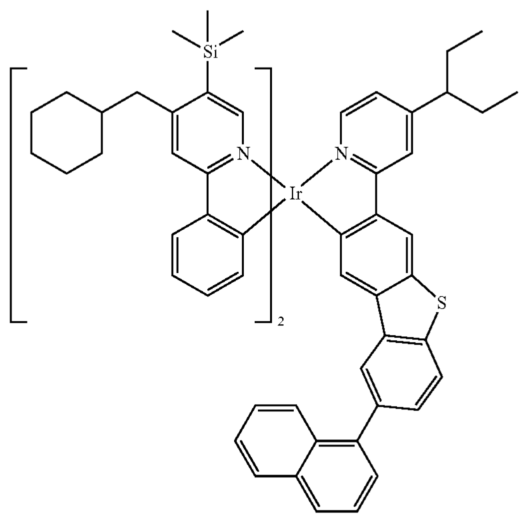
1253
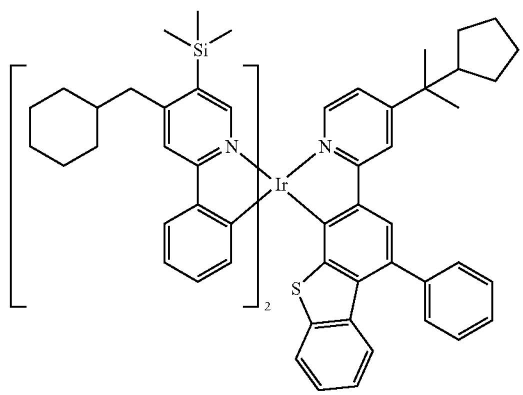
1254
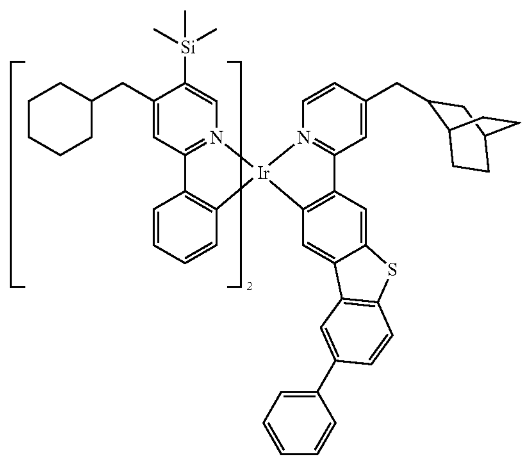
-continued
1255
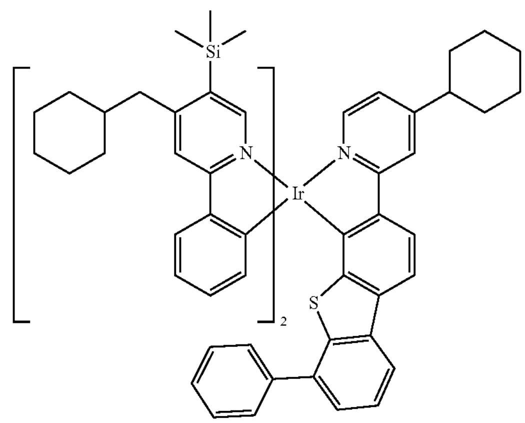
1256
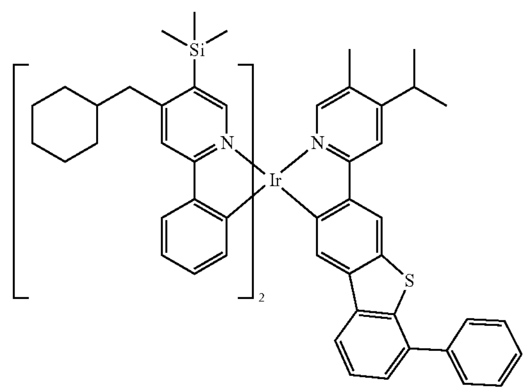
1257
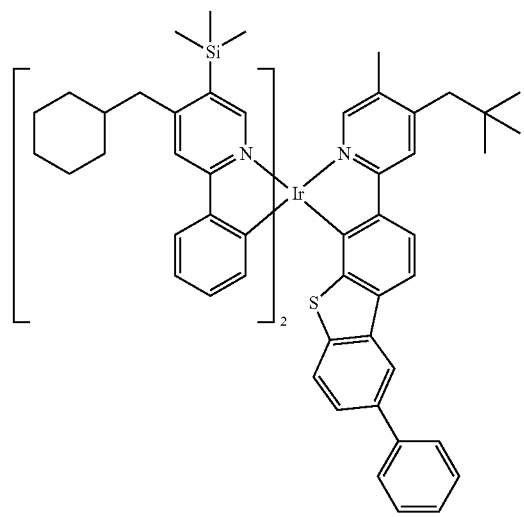

-continued
1258
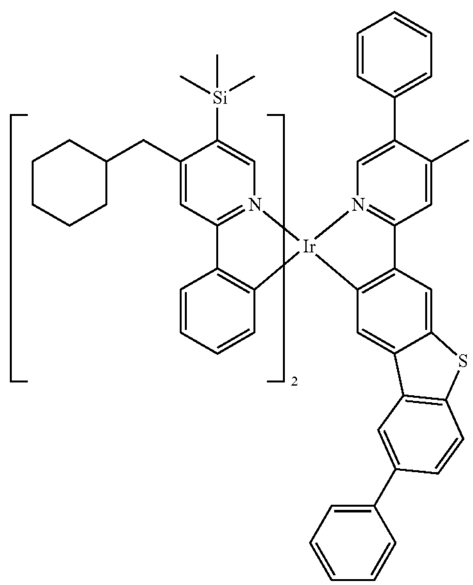
1259
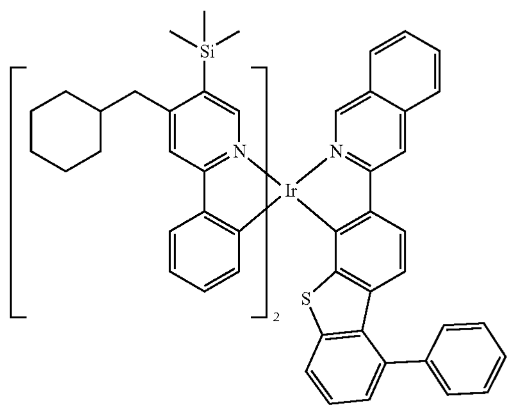
1260
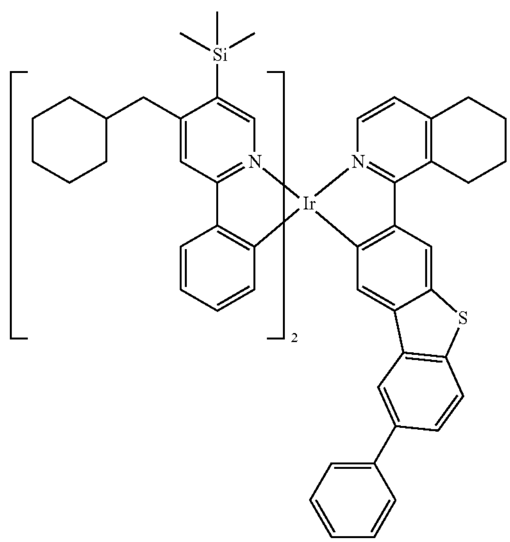
-continued
1261
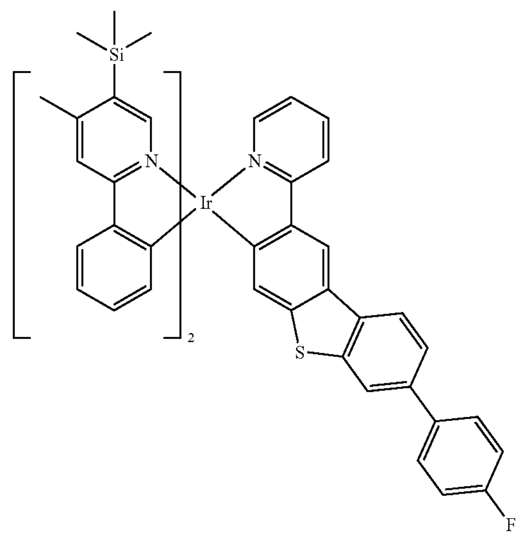
1262
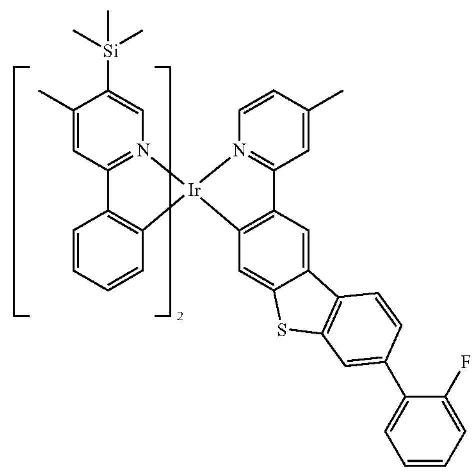
1263
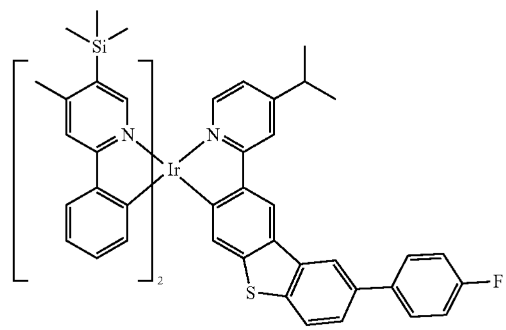

1264
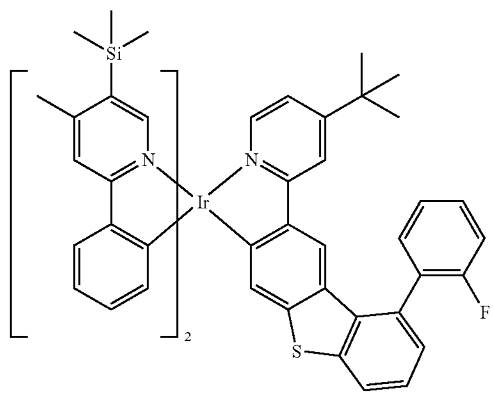
1265
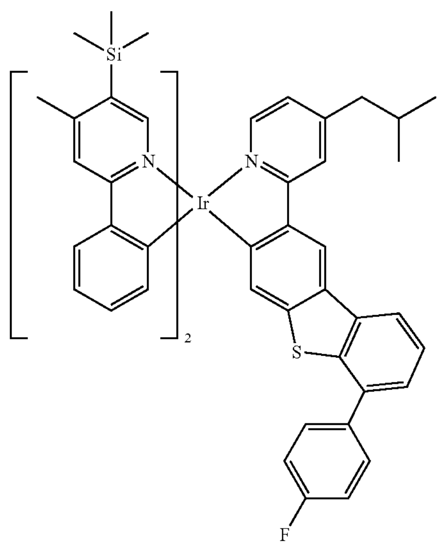
1266
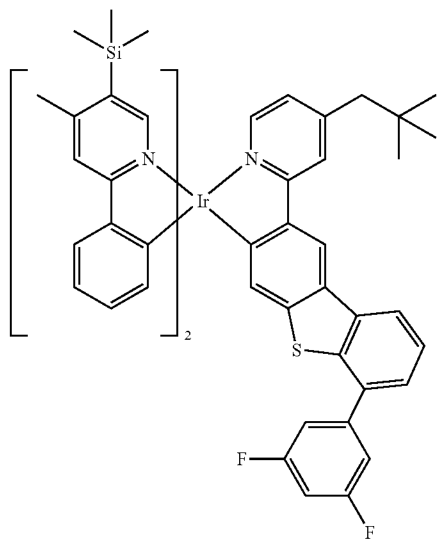
1267
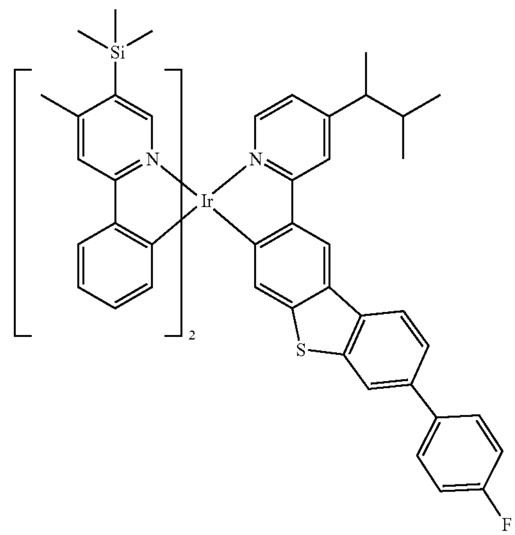
1268
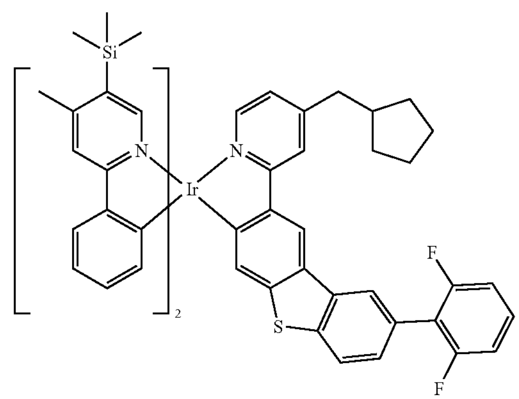
1269
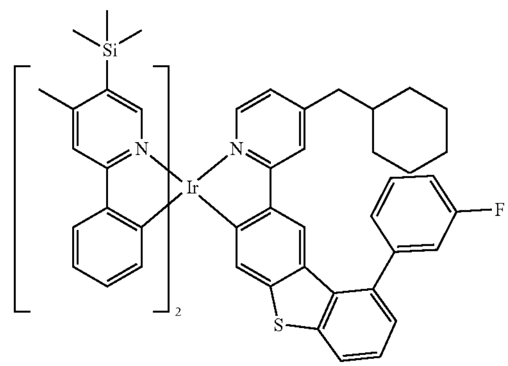

-continued
1270
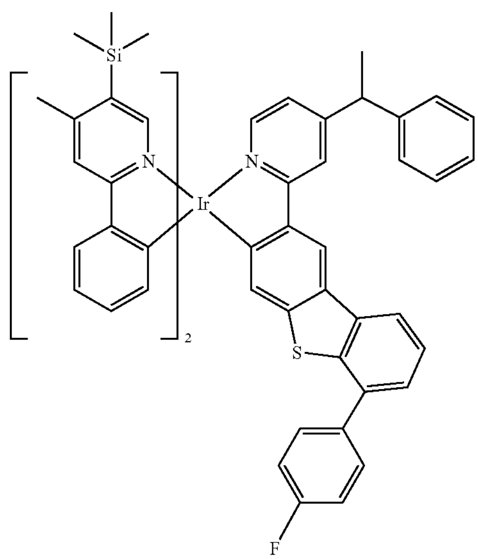
1271
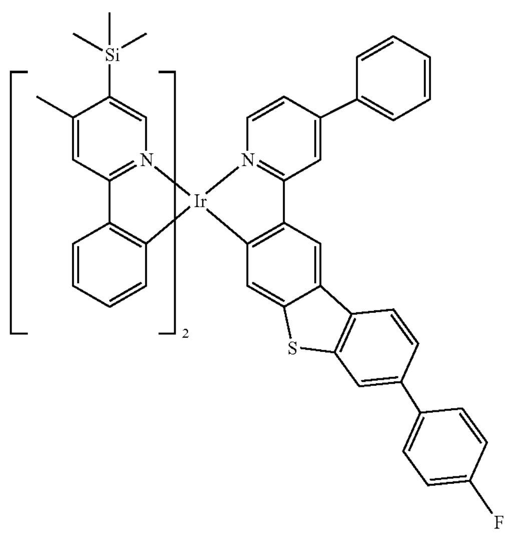
1272
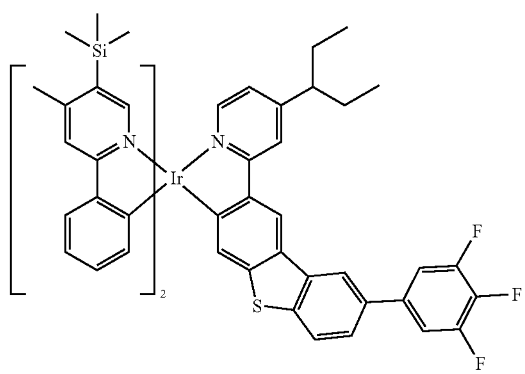
-continued
1273
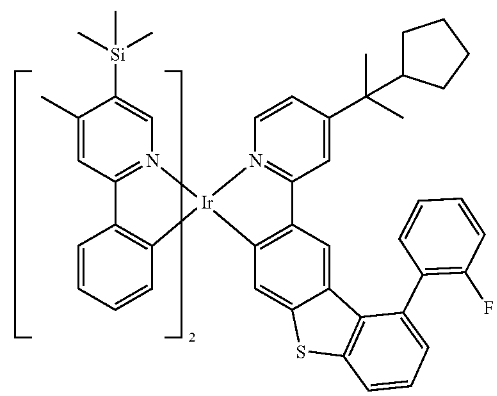
1274
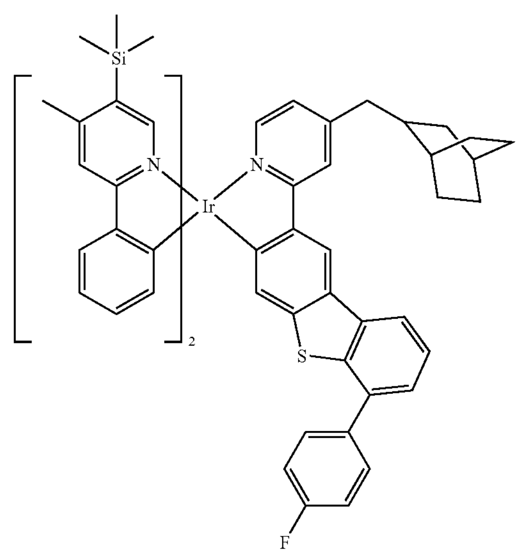
1275
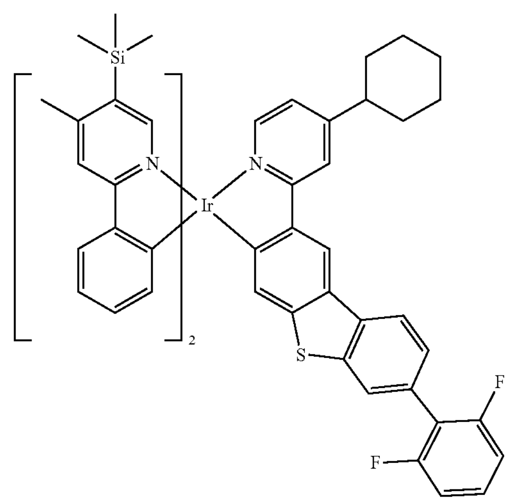

-continued
1276
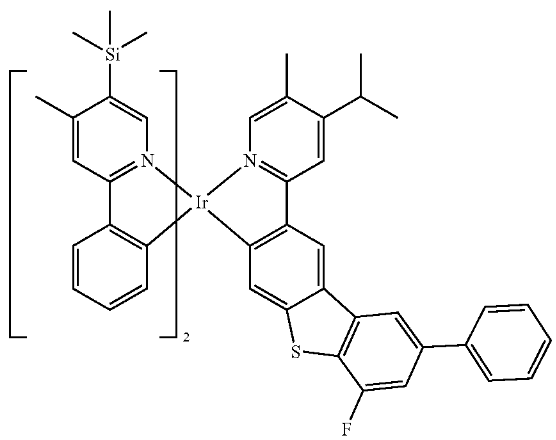
1277
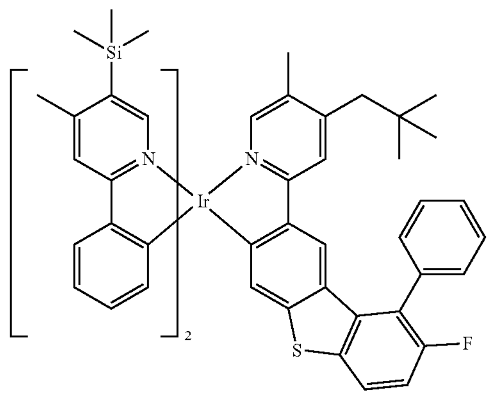
1278
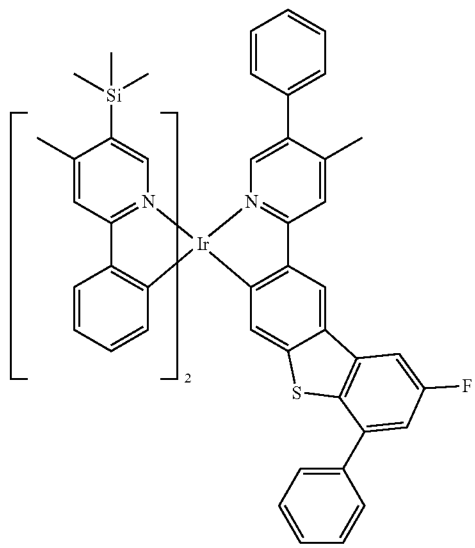
-continued
1279
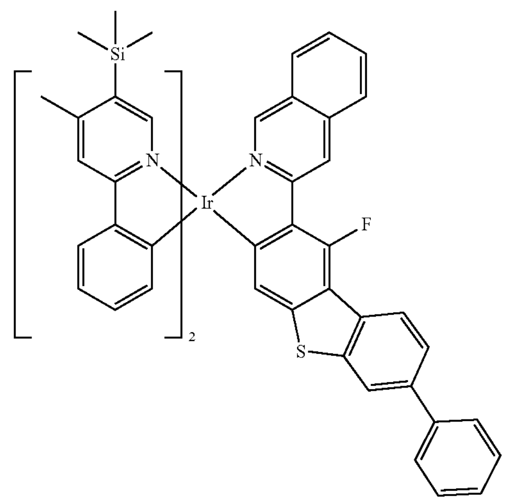
1280
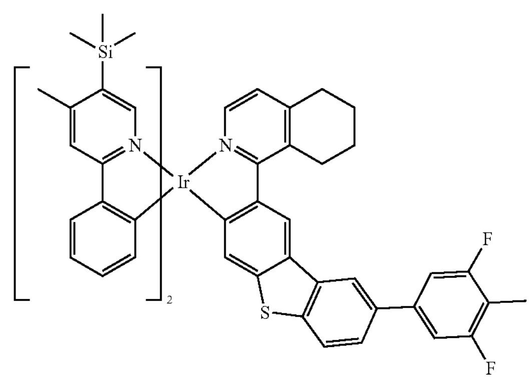
1281
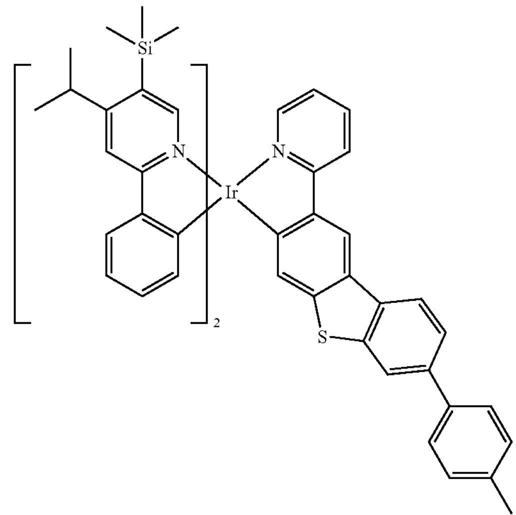

-continued
1282
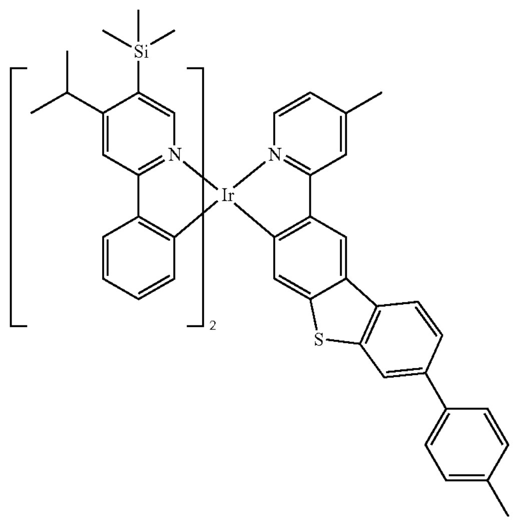
1283
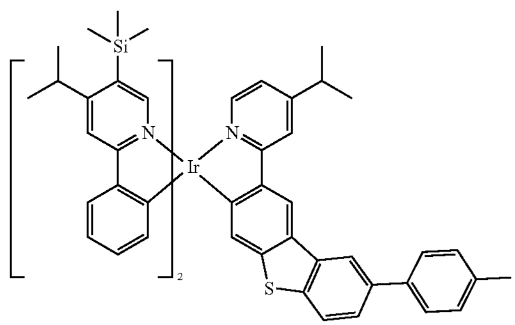
1284
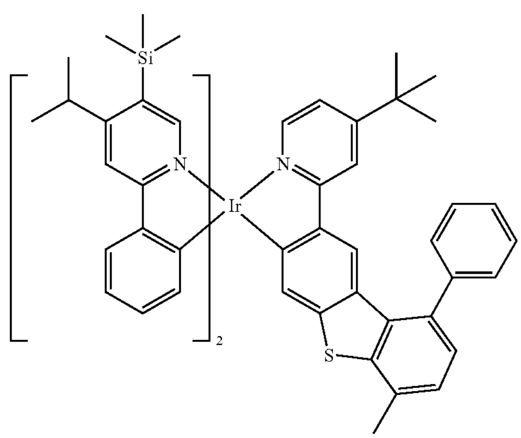
-continued
1285
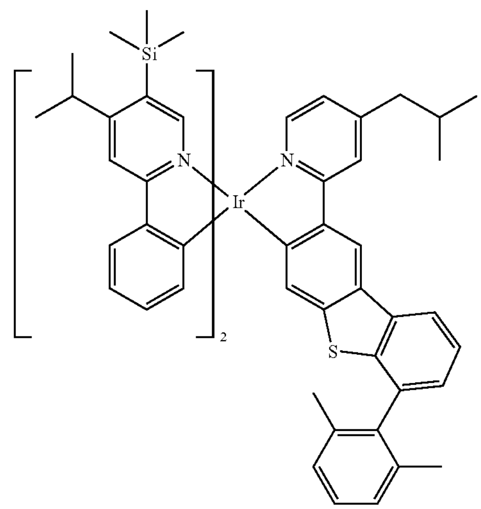
1286
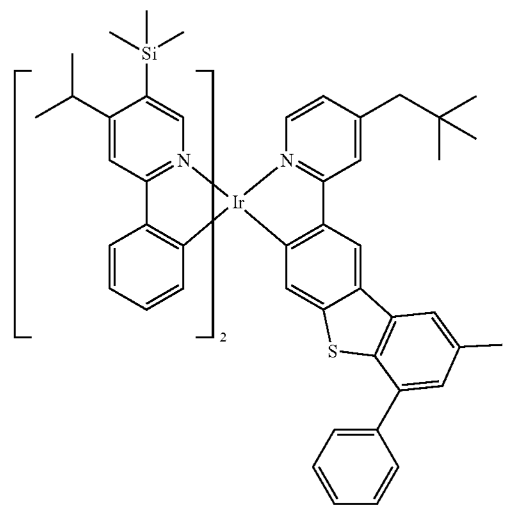
1287
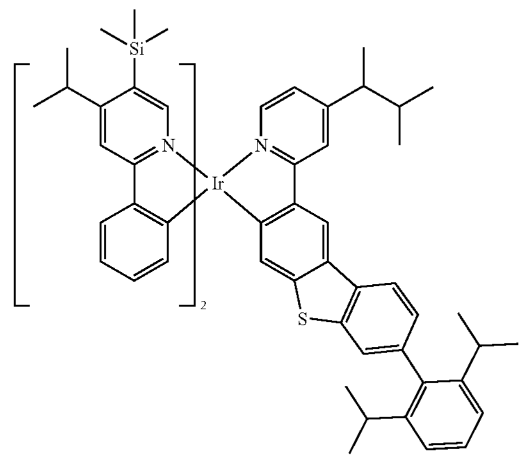

-continued
1288
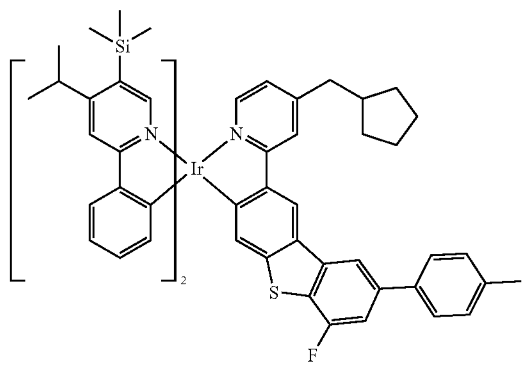
1289
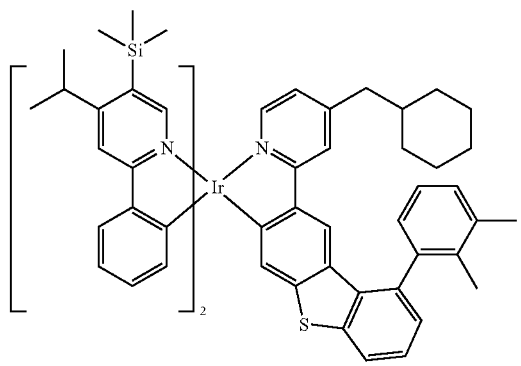
1290
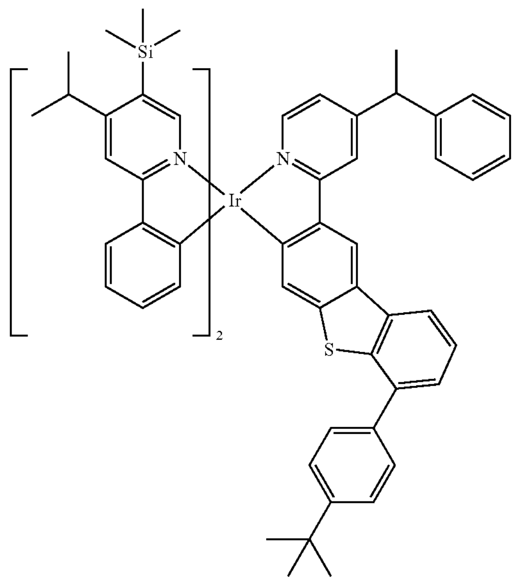
-continued
1291
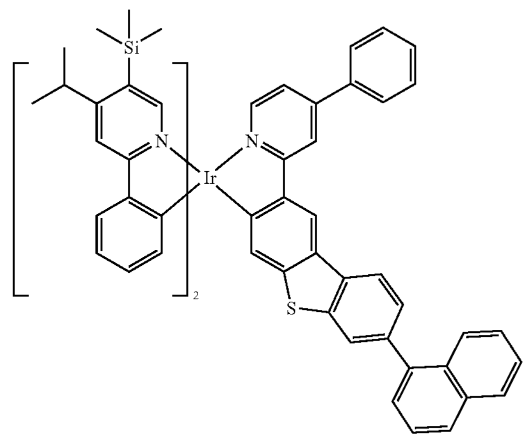
1292
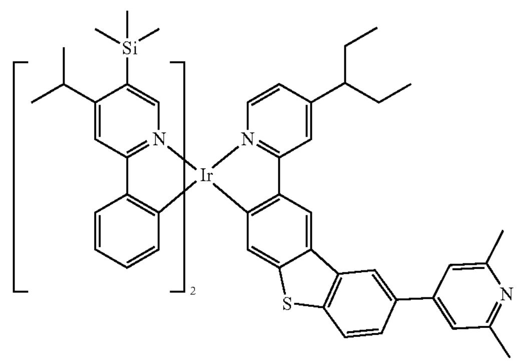
1293
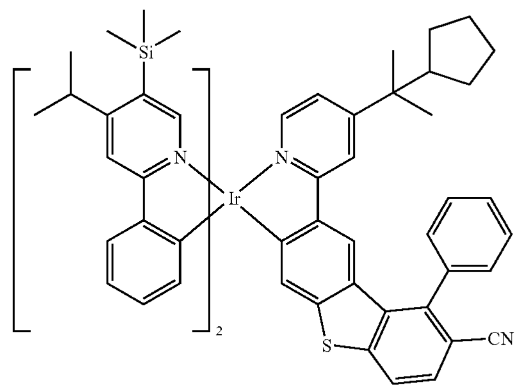

1294
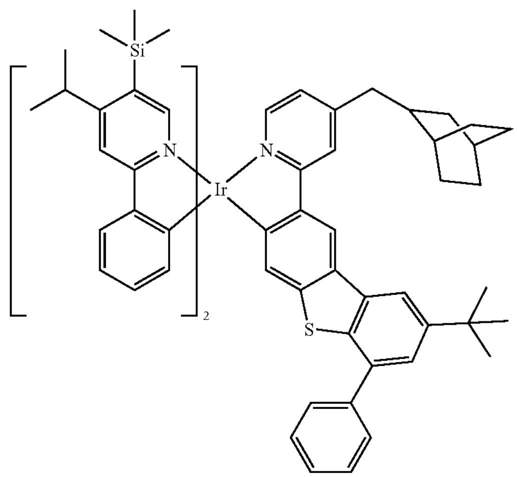
1295
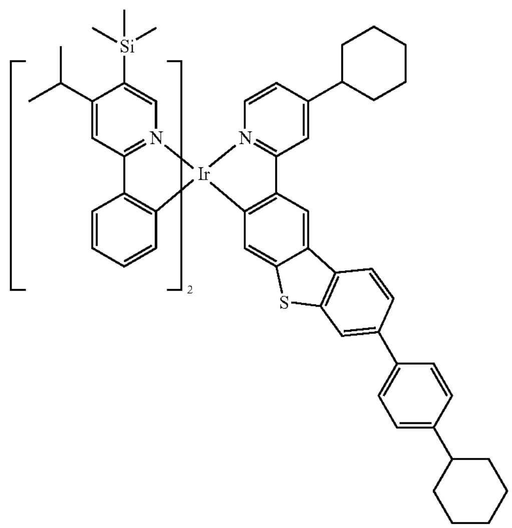
1296
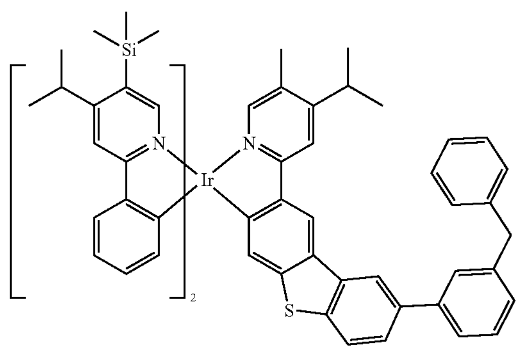
1297
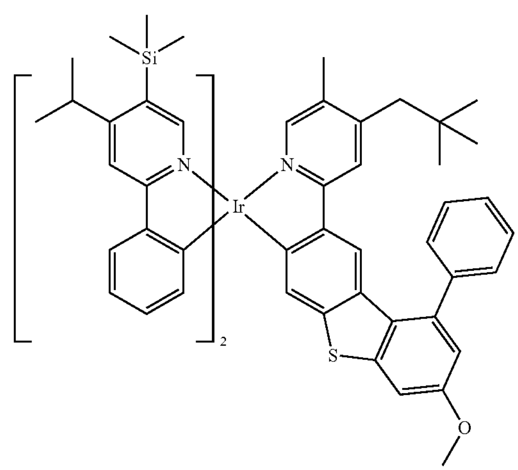
1298
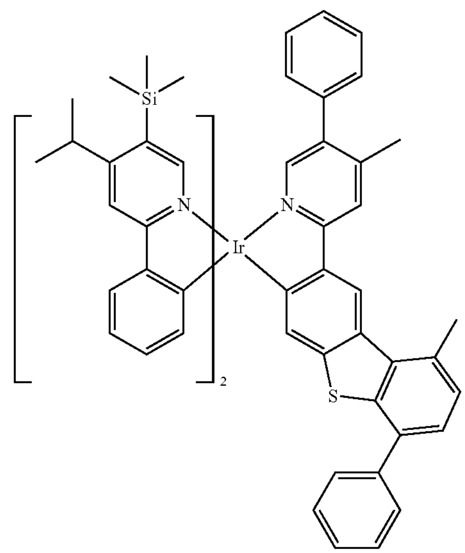
1299
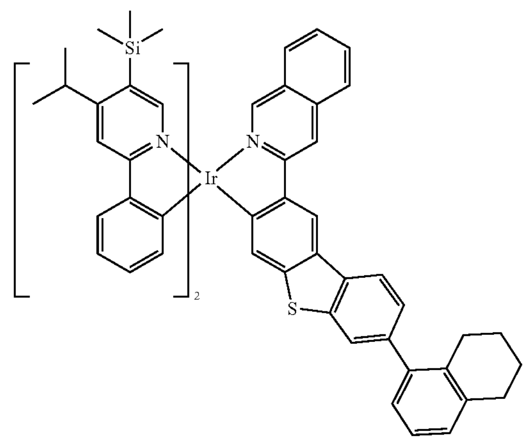

-continued
1300
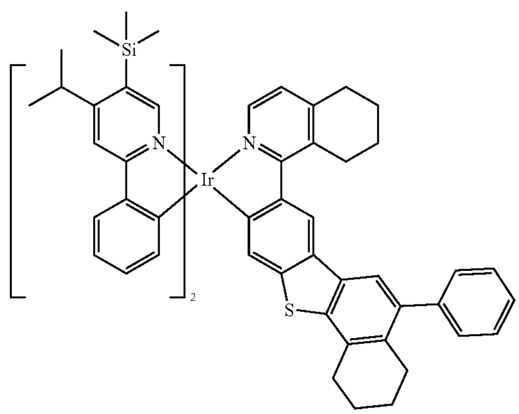
1301
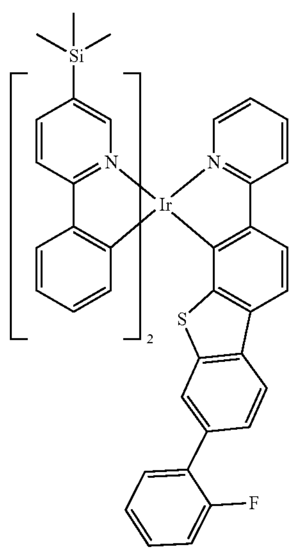
1302
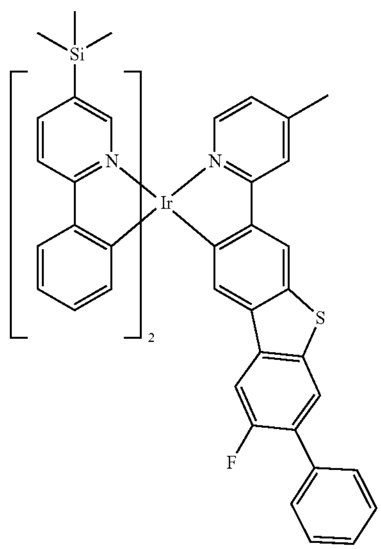
-continued
1303
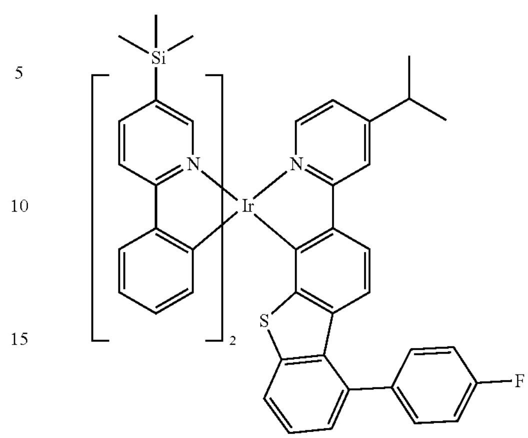
1304
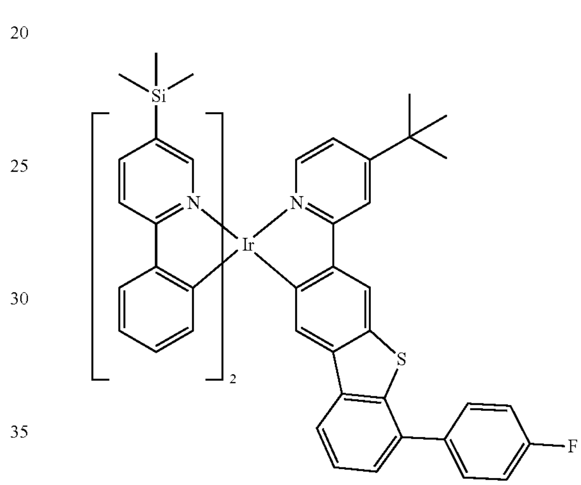
1305
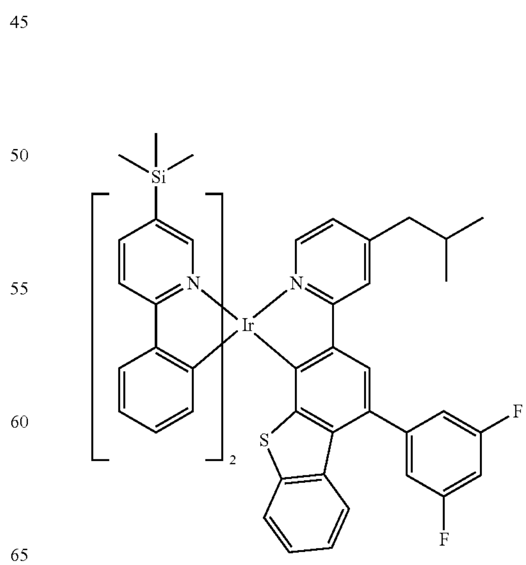

-continued
1306
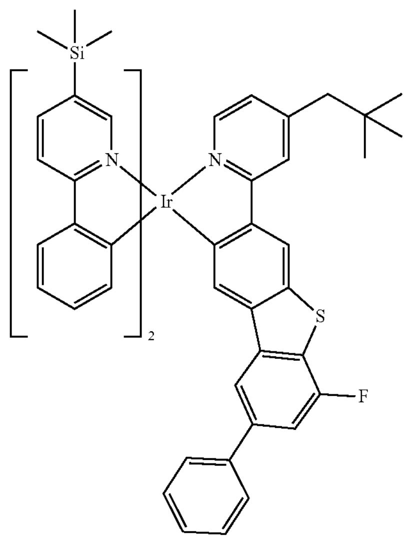
1307
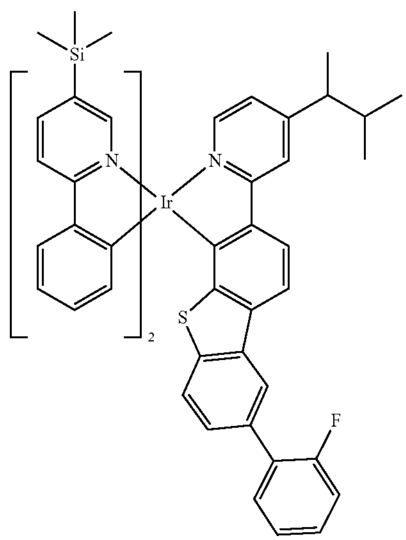
1308
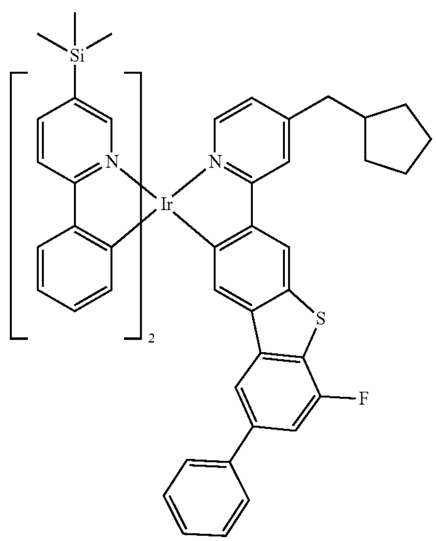
-continued
1309
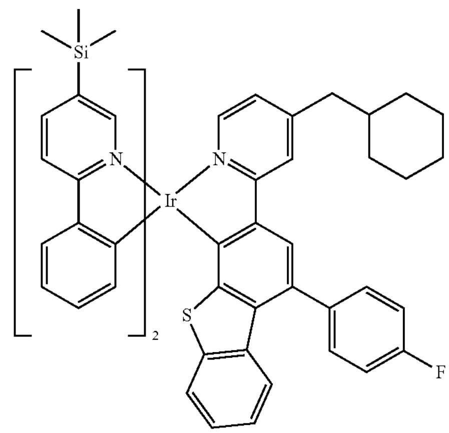
1310
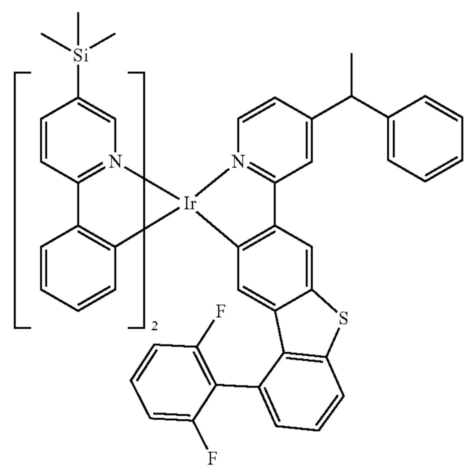
1311
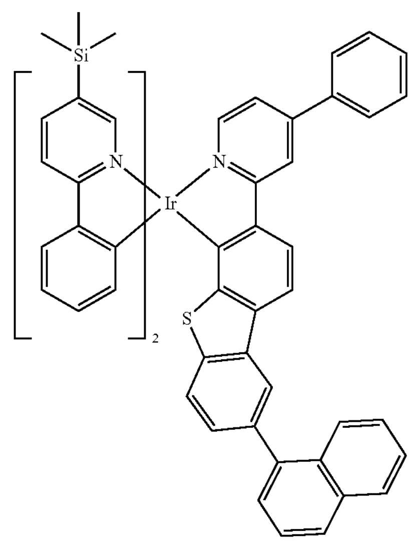

-continued
1312
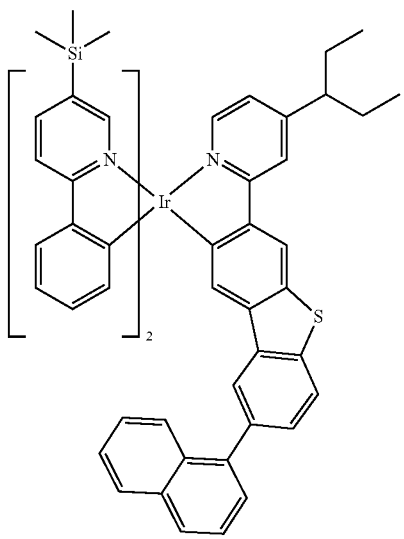
1313
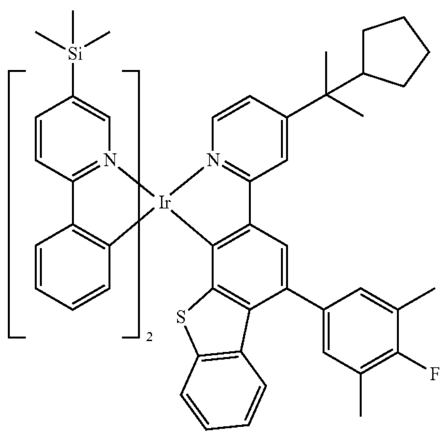
1314
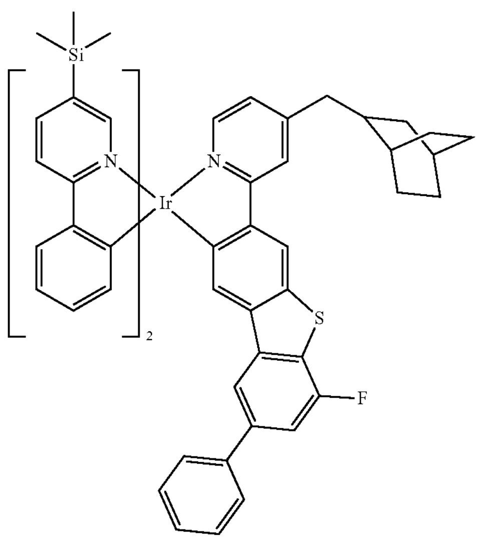
-continued
1315
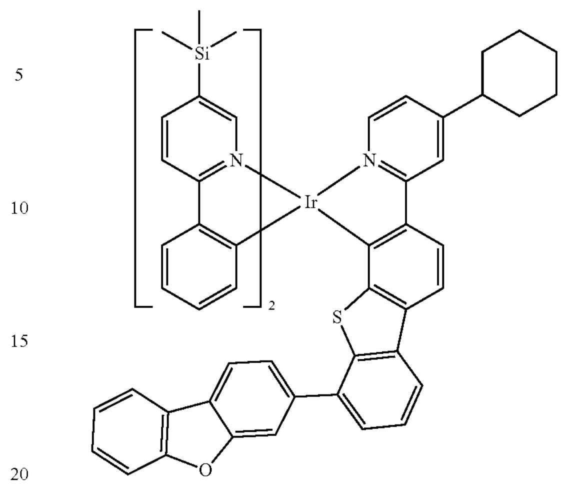
1316
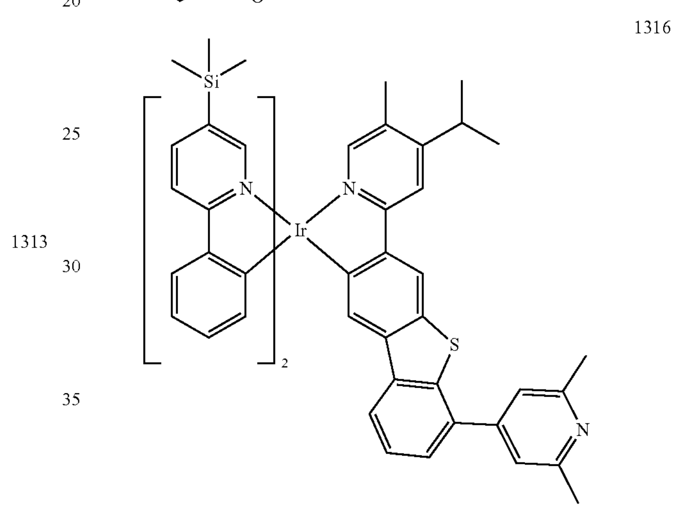
1317
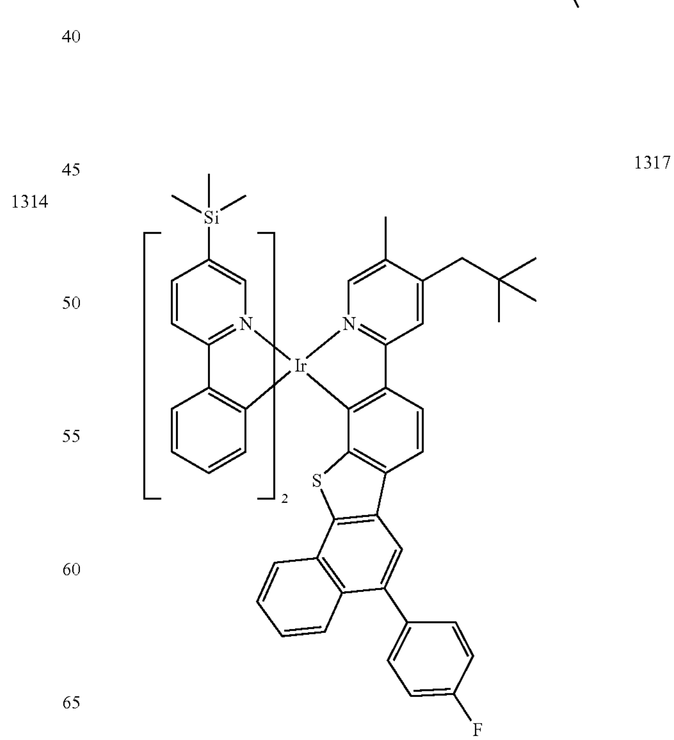

-continued
1318
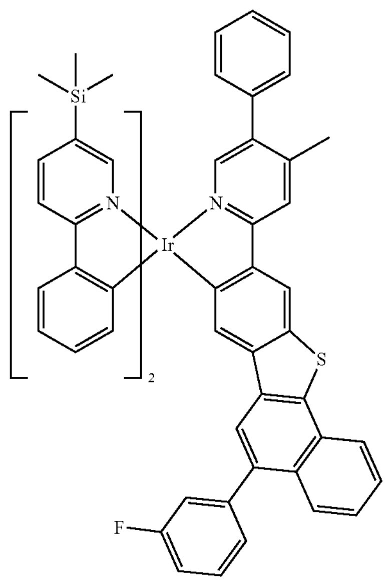
1319
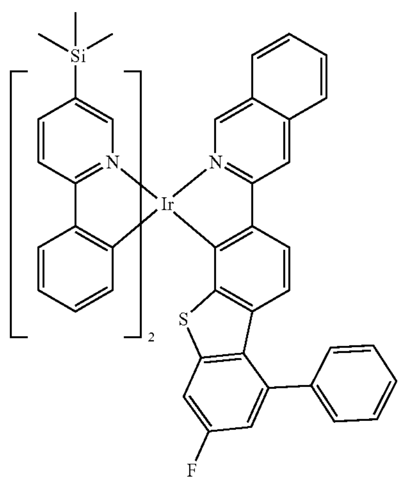
1320
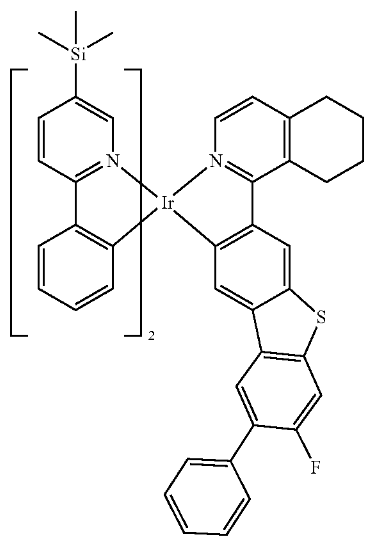
-continued
1321
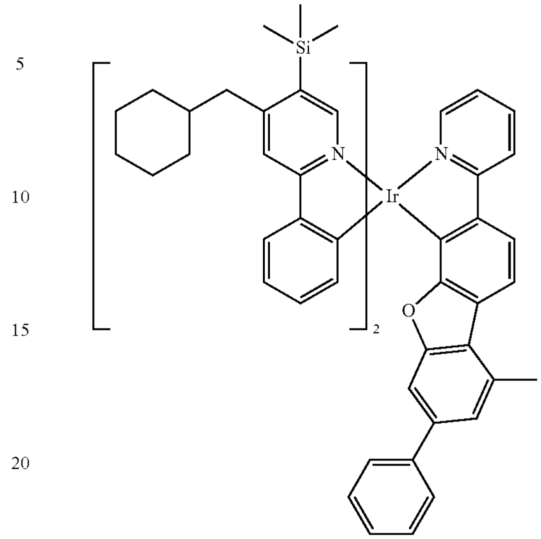
1322
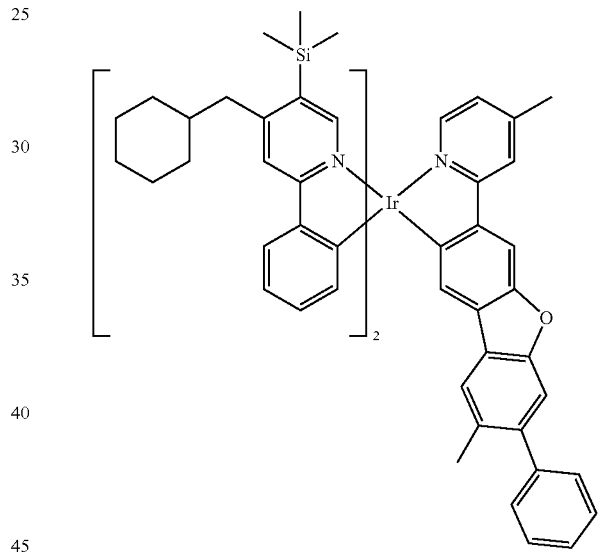
1323
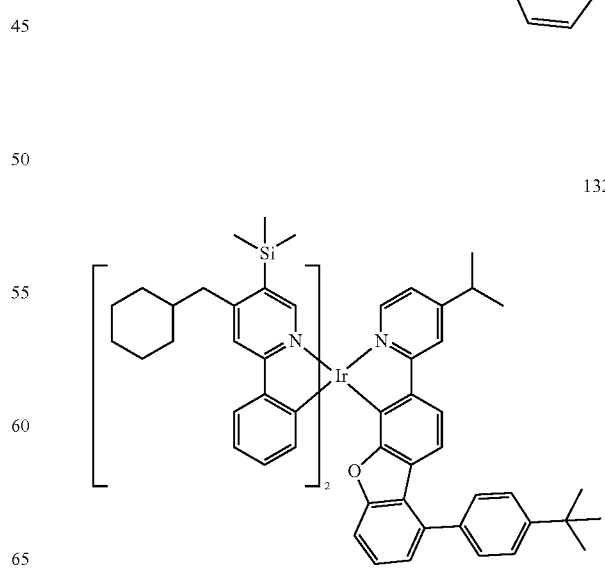

-continued
1324
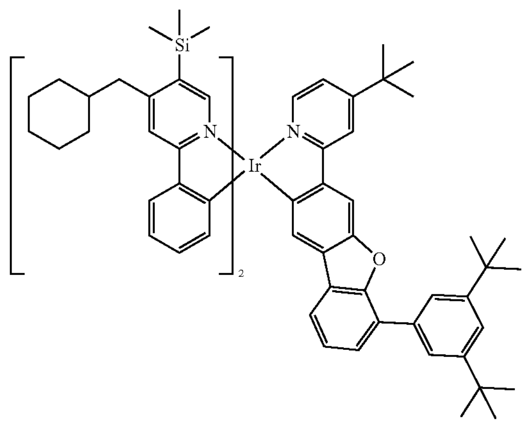
1325
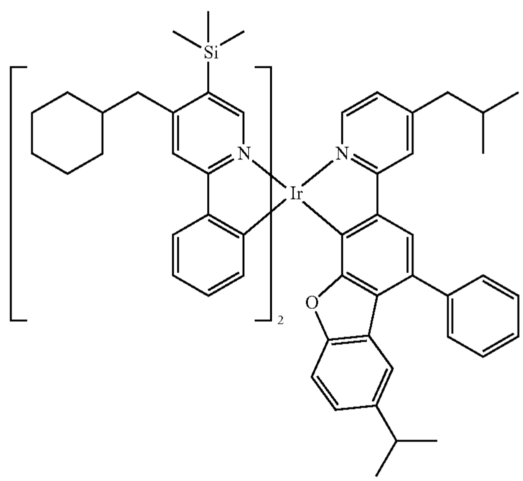
1326
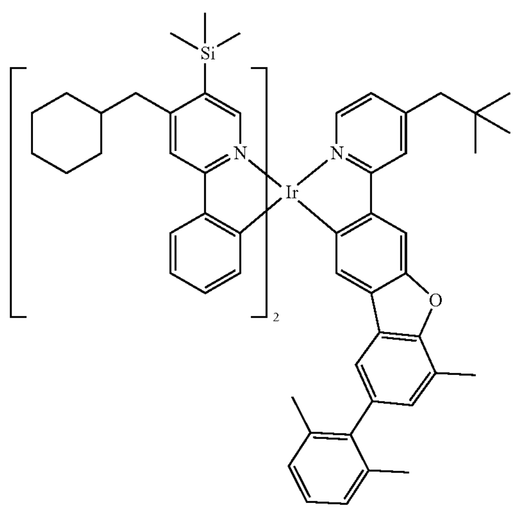
-continued
1327
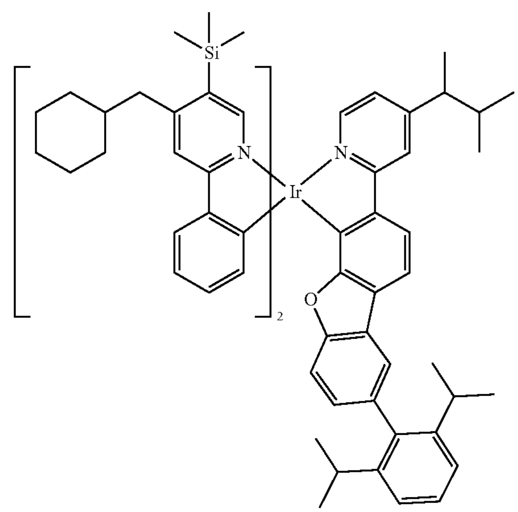
1328
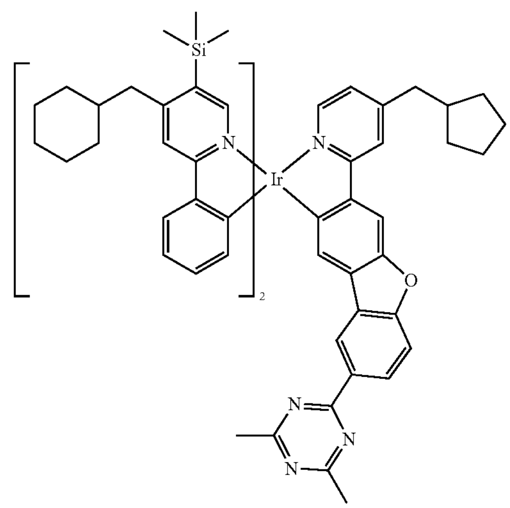
1329
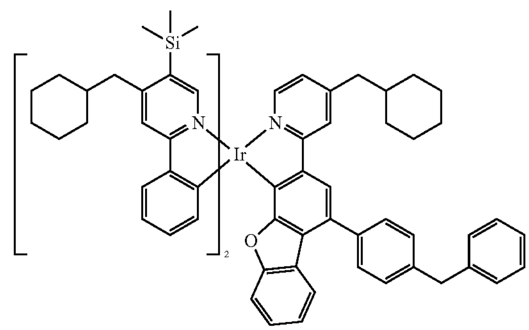

-continued
1330
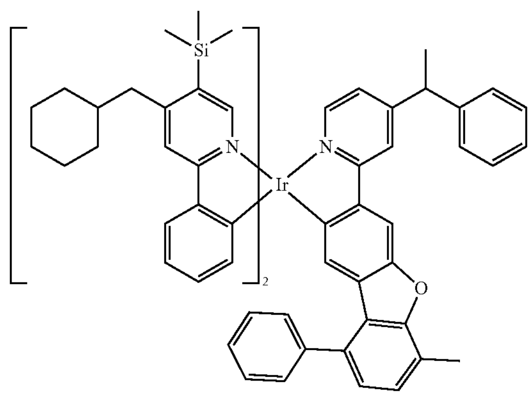
1331
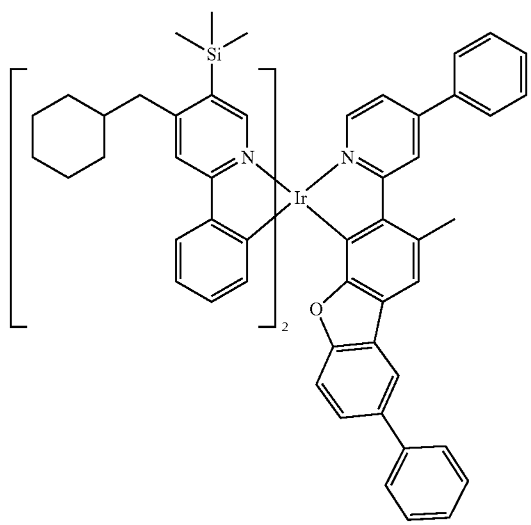
1332
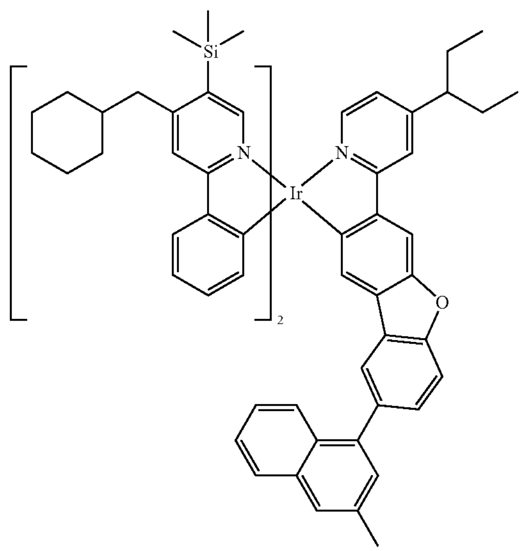
-continued
1333
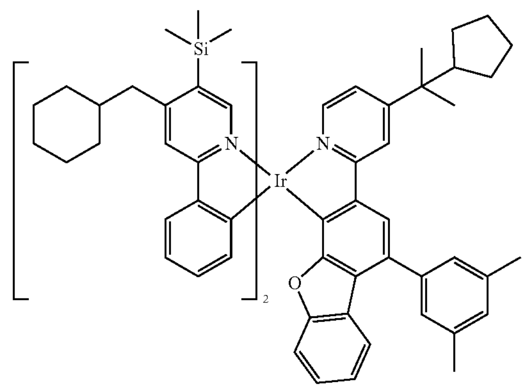
1334
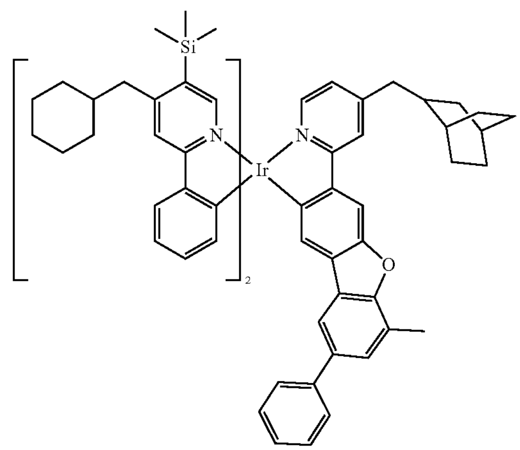
1335
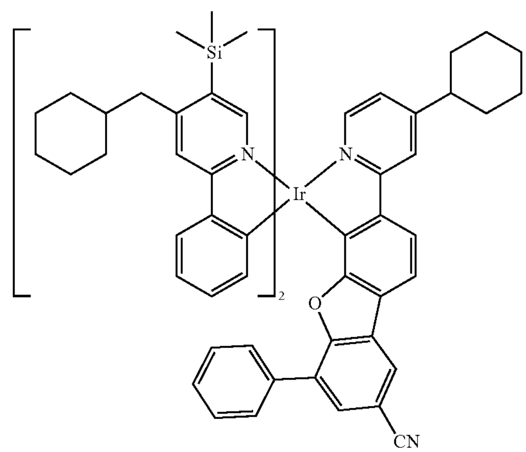

-continued
1336
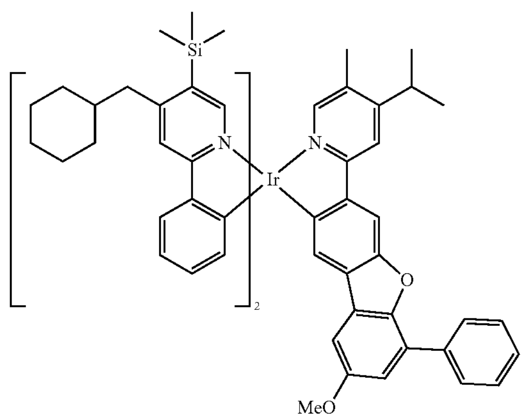
1337
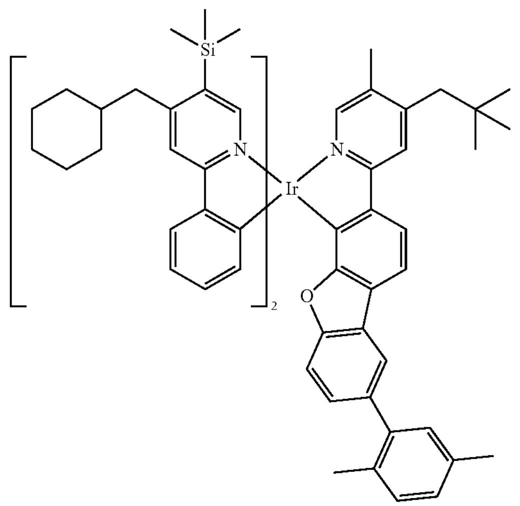
1338
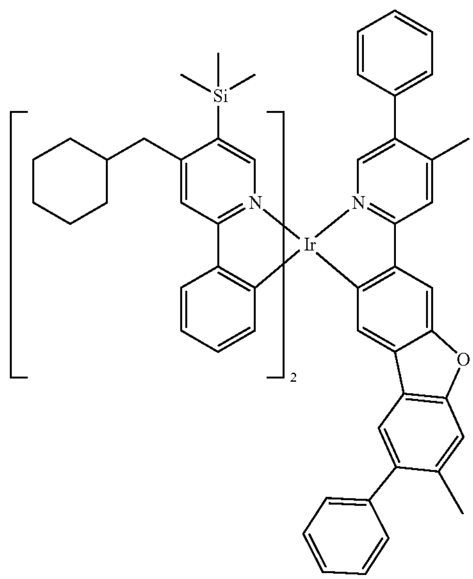
-continued
1339
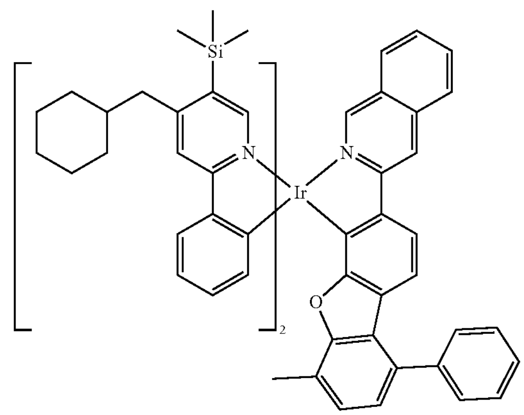
1340
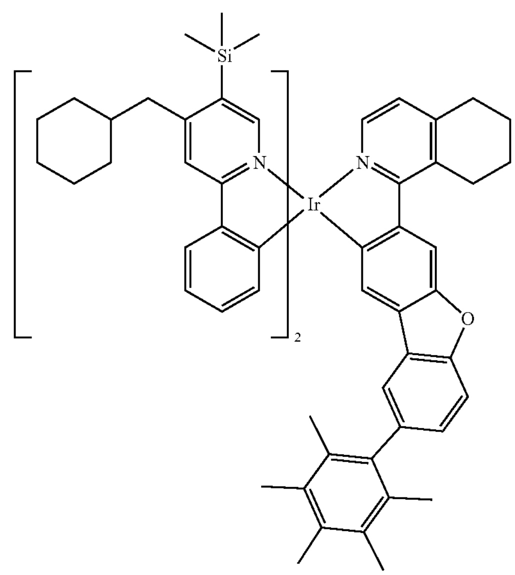
1341
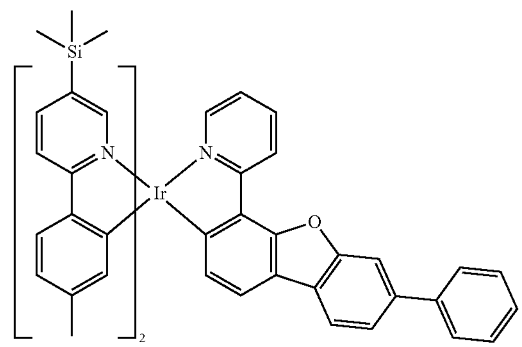

-continued
1342
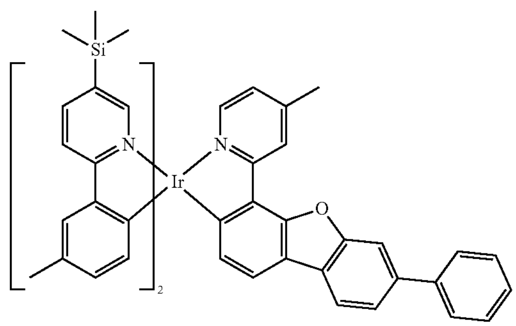
1343
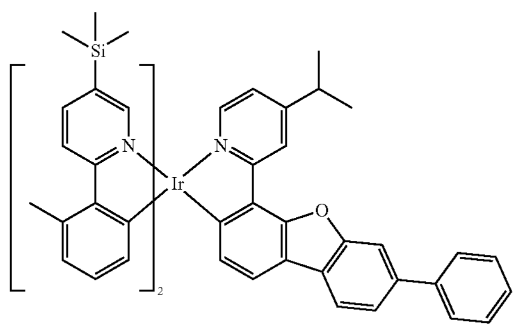
1344
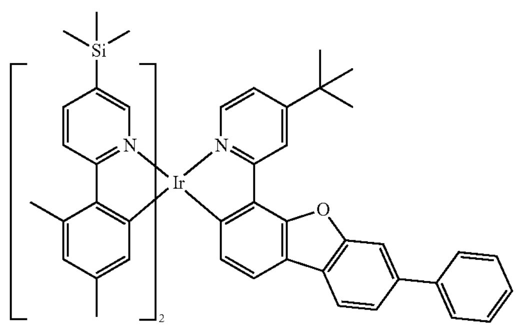
1345
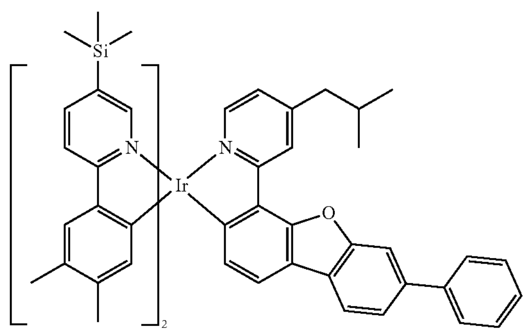
-continued
1346
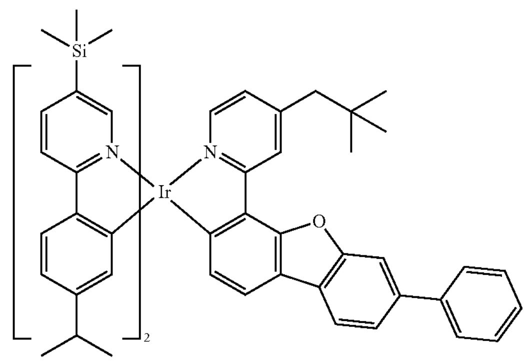
1347
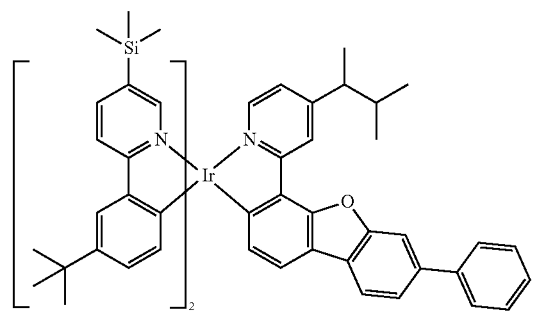
1348
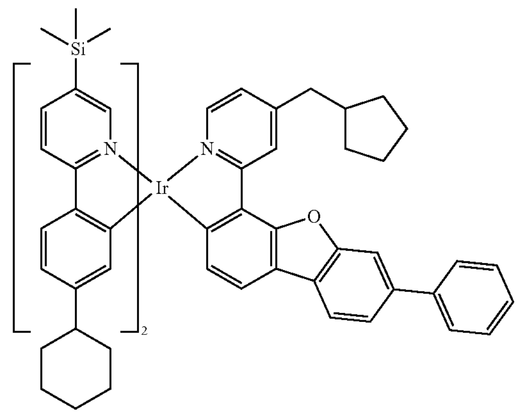
1349
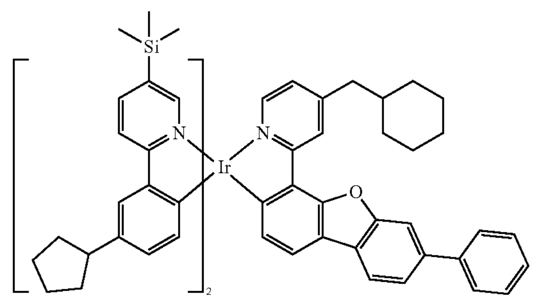

-continued
1350
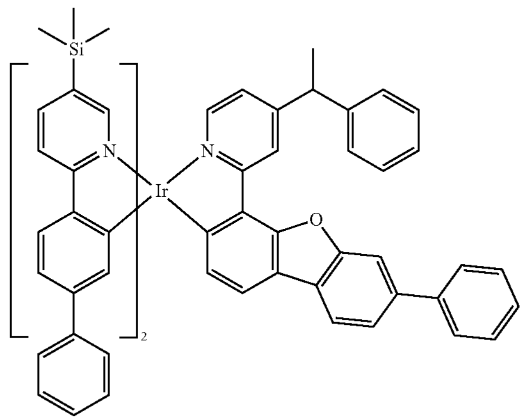
1351
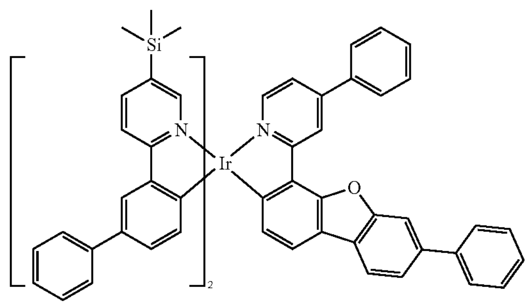
1352
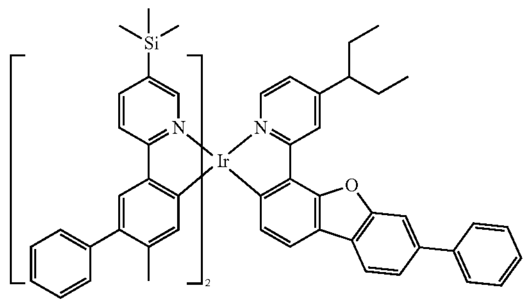
1353
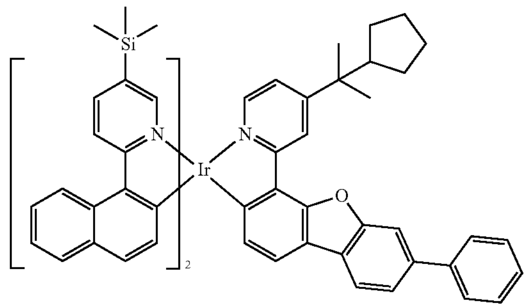
-continued
1354
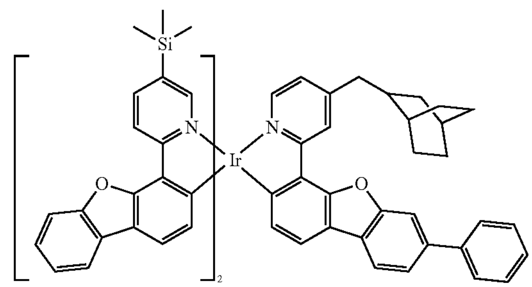
1355
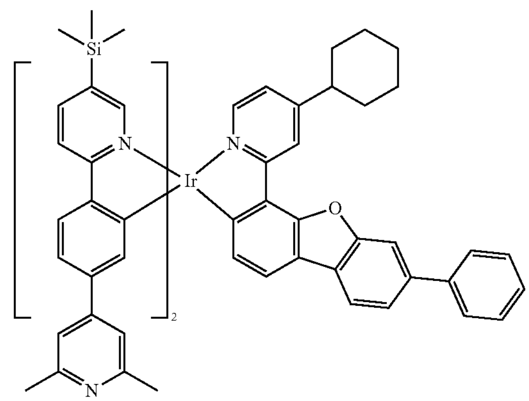
1356
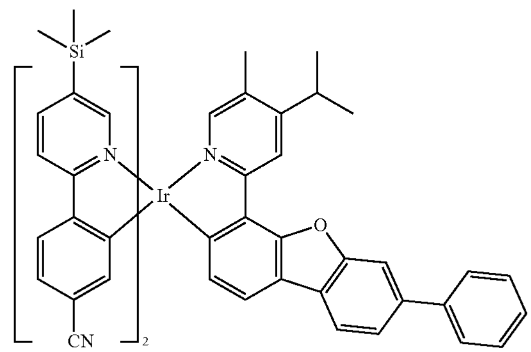
1357
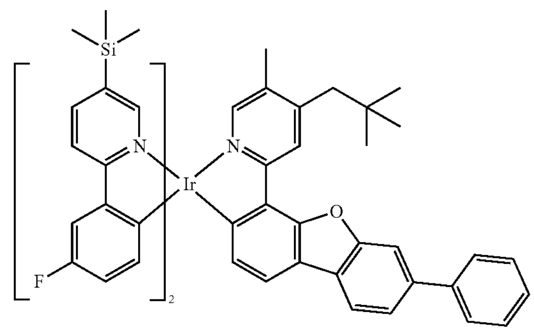

-continued
1358
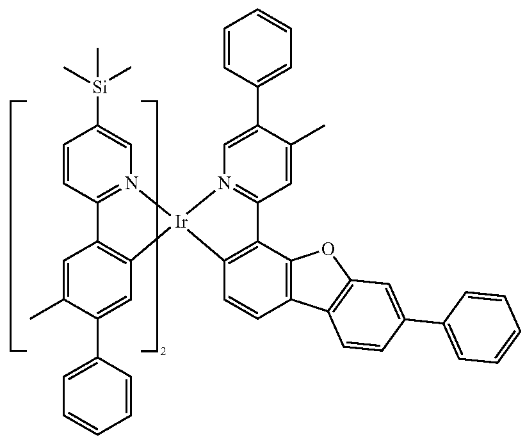
1359
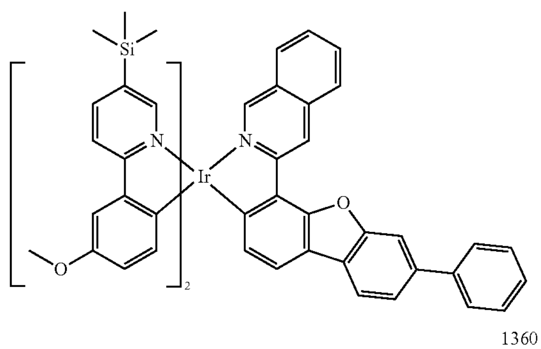
1360
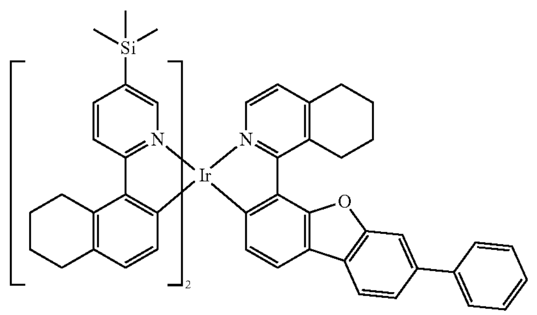
1361
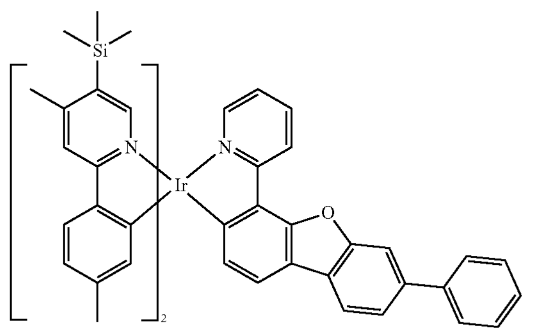
-continued
1362
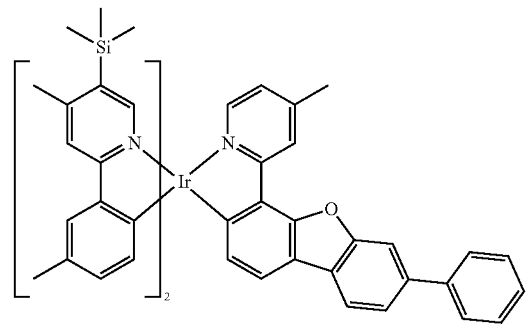
1363
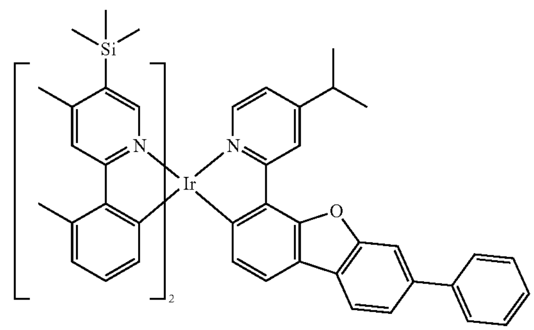
1364
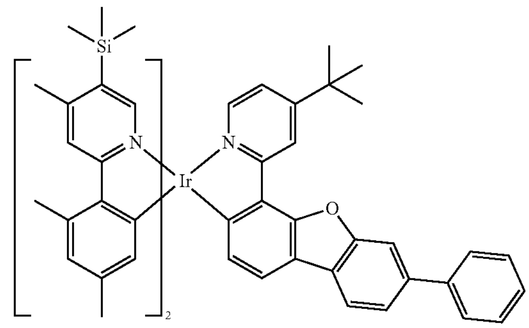
1365
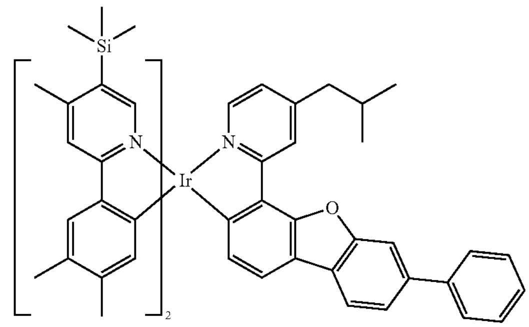

-continued
1366
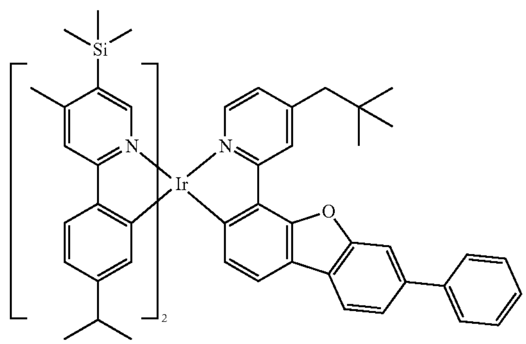
1367
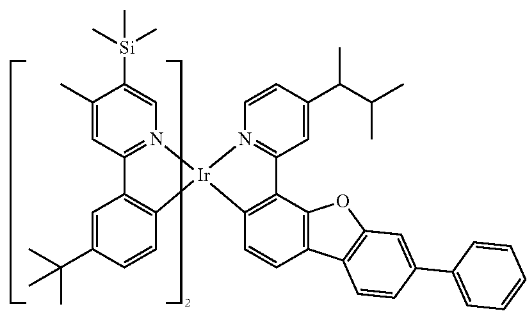
1368
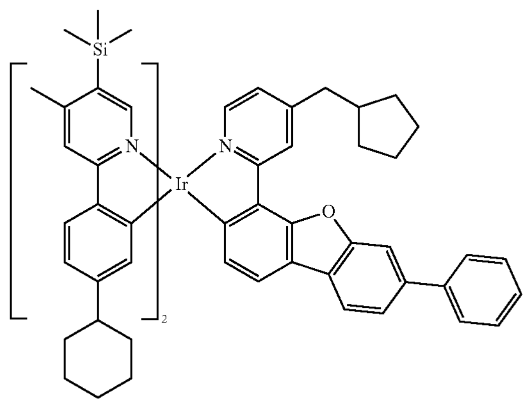
1369
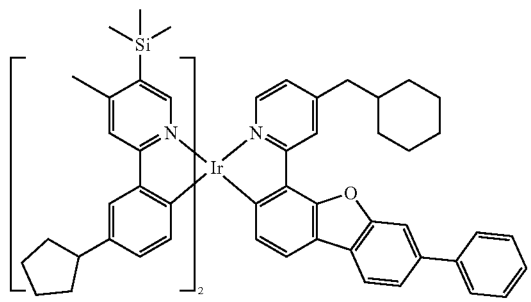
-continued
1370
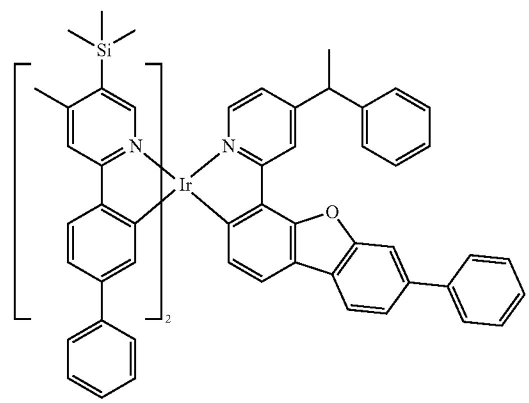
1371
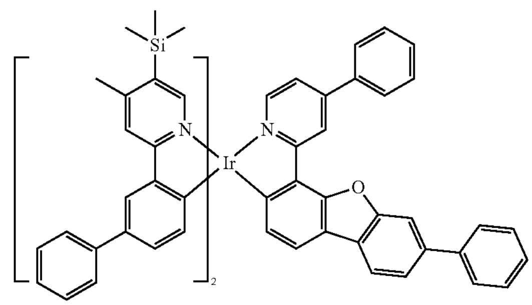
1372
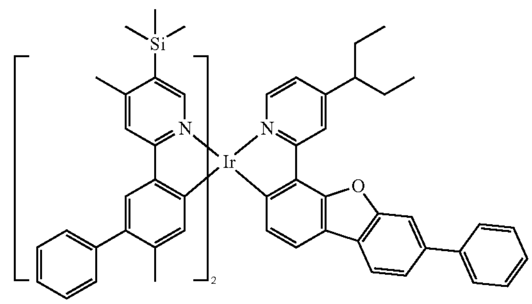
1373
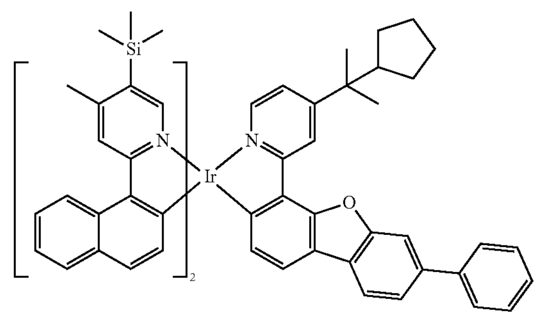

-continued
1374
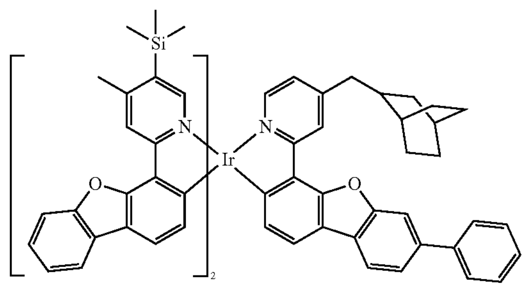
1375
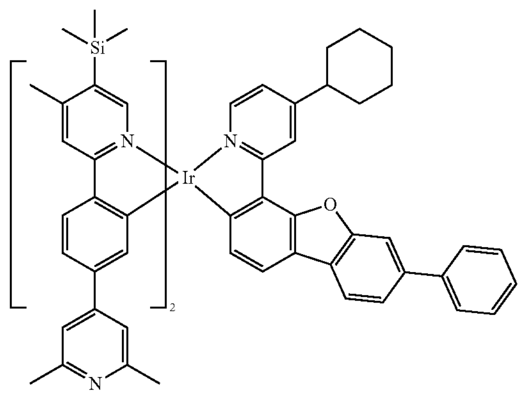
1376
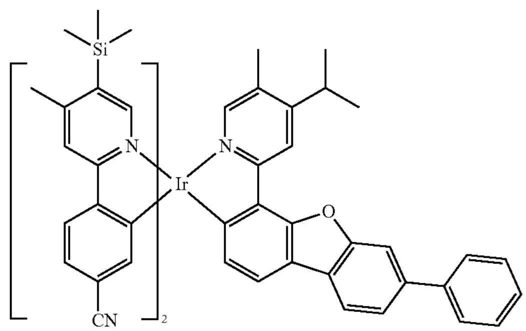
1377
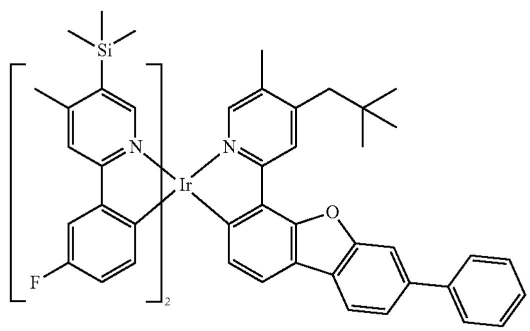
-continued
1378
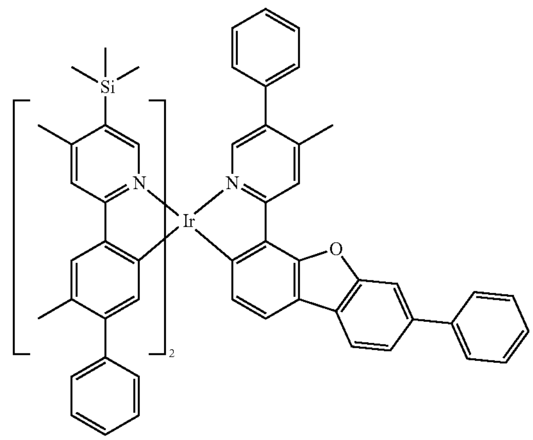
1379
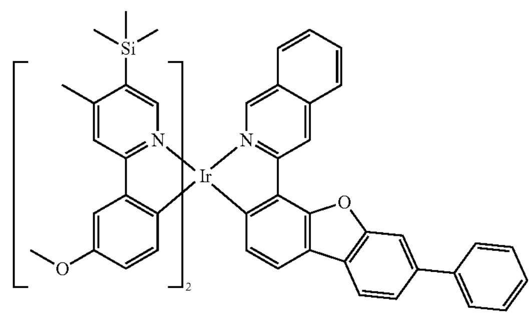
1380
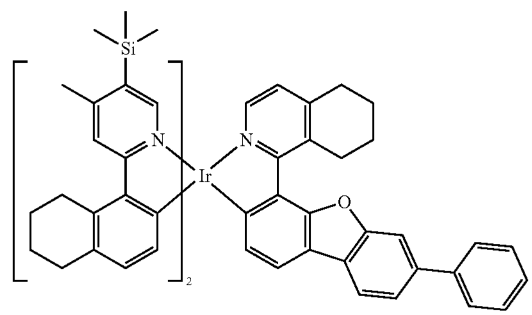
1381
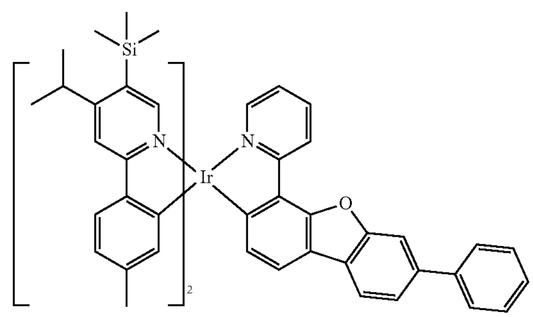

-continued
1382
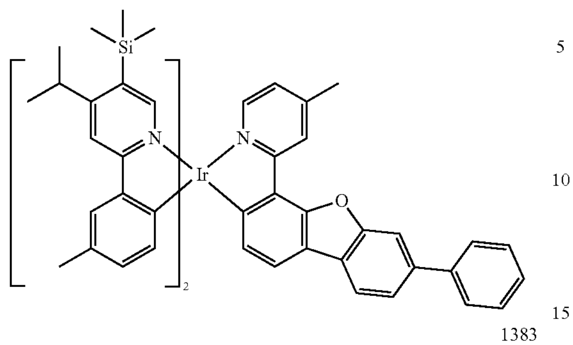
1383
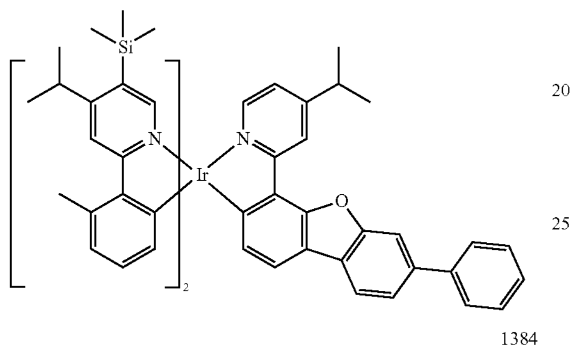
1384
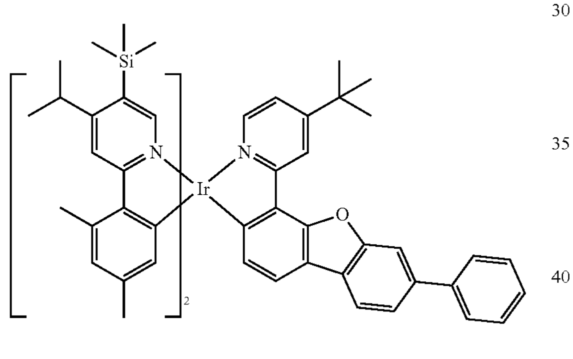
1385
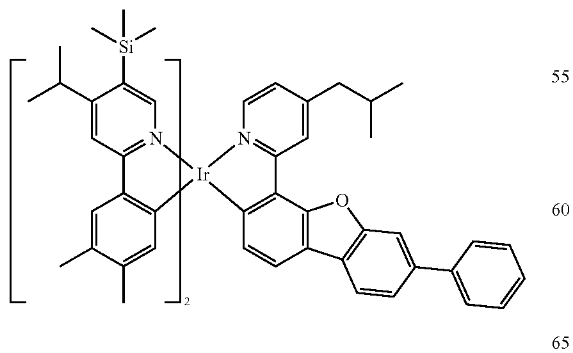
-continued
1386
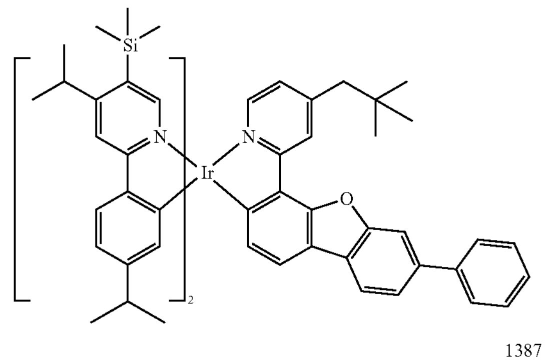
1387
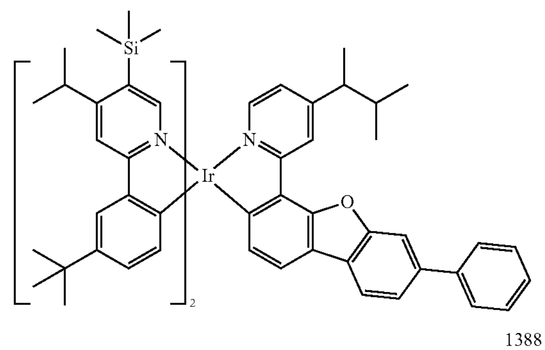
1388
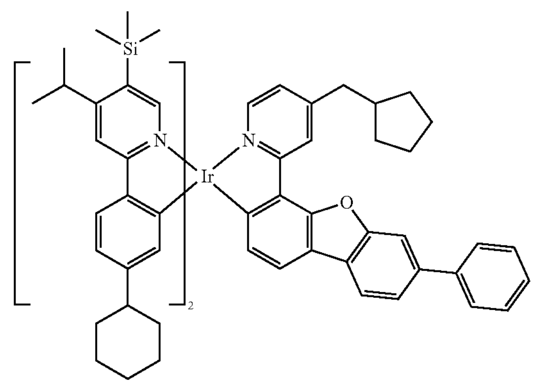
1389
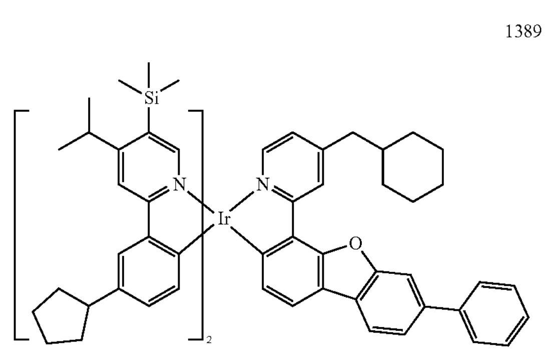

-continued
1390
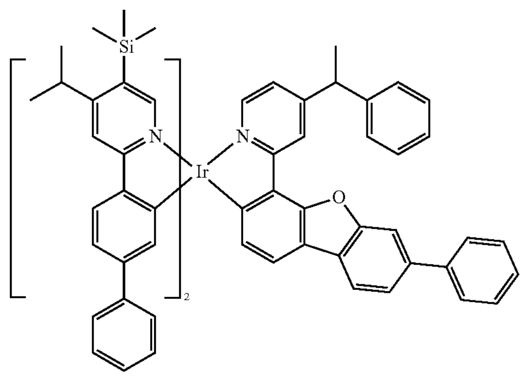
1391
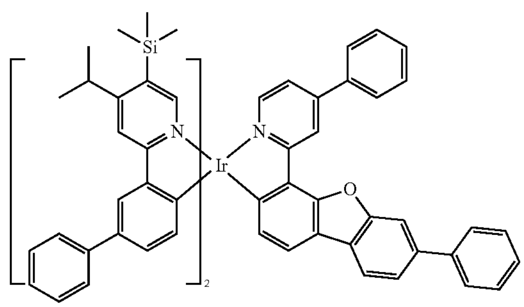
1392
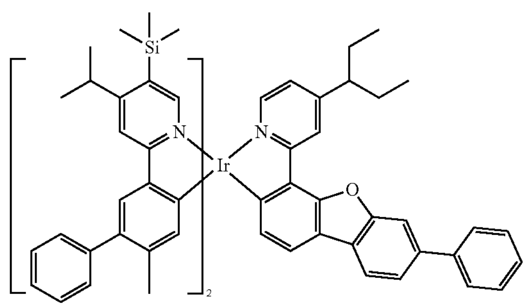
1393
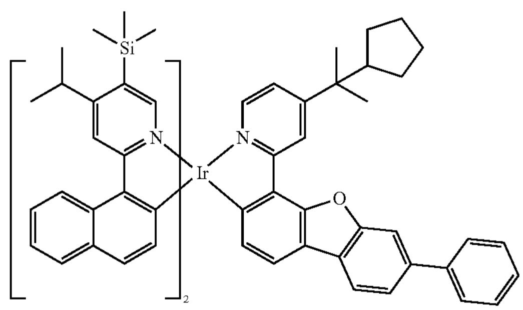
-continued
1394
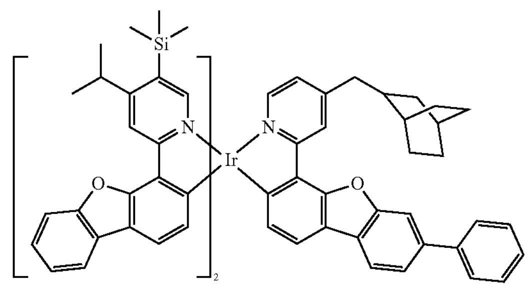
1395
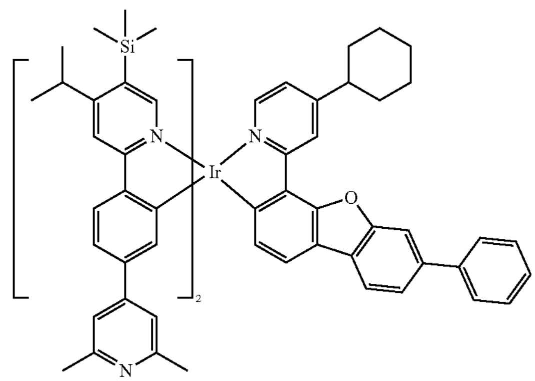
1396
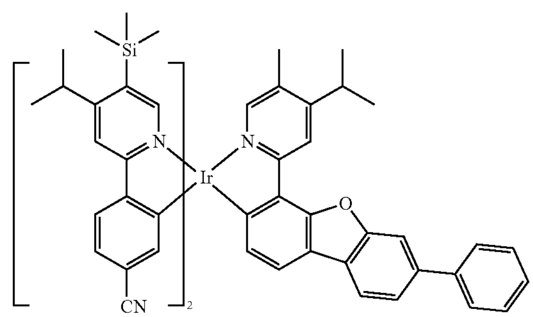
1397
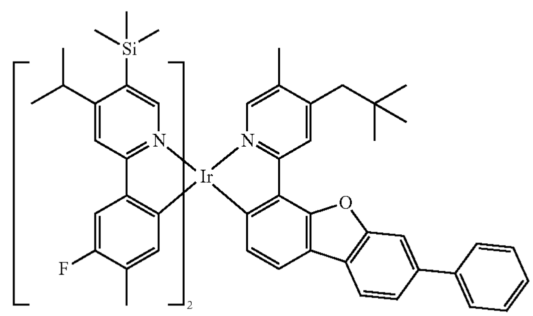

1398
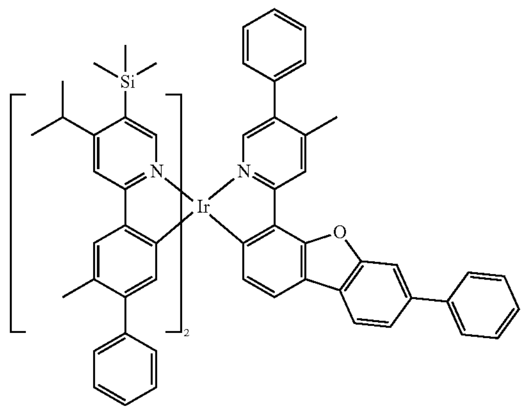
1399
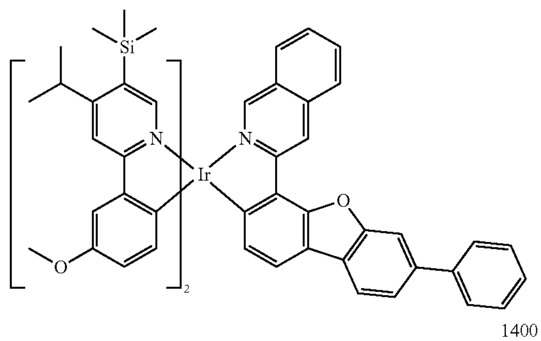
1400
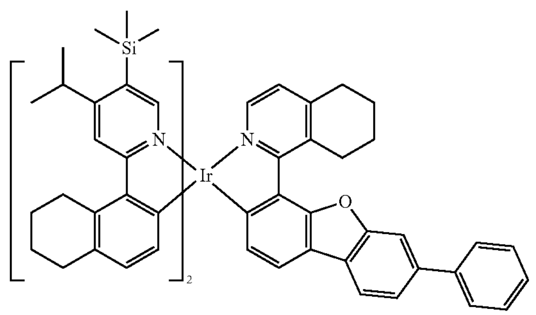
1401
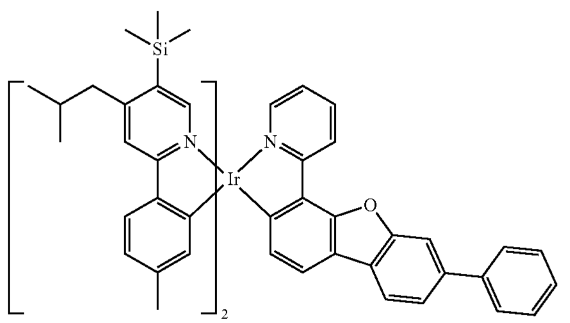
1402
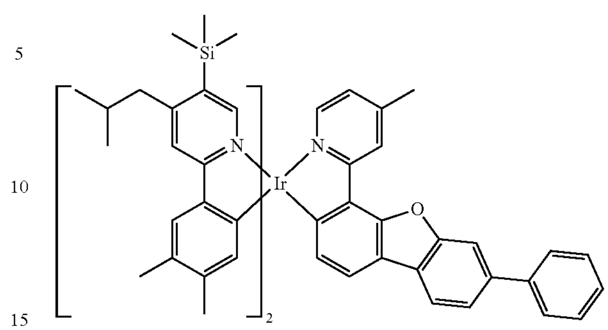
1403
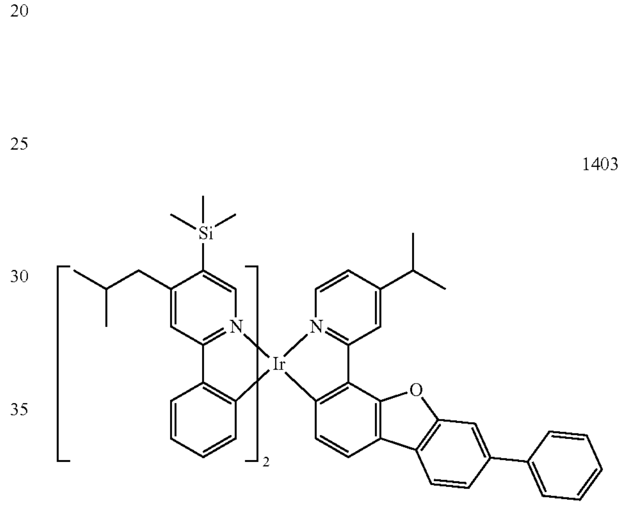
1404
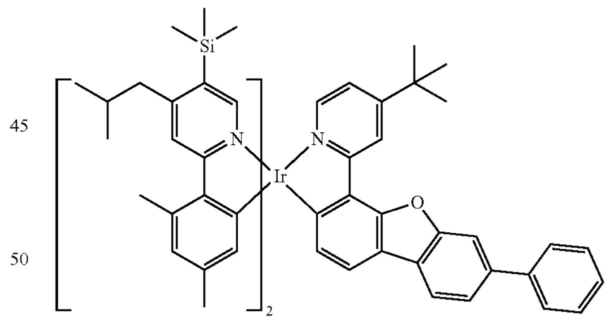
1405
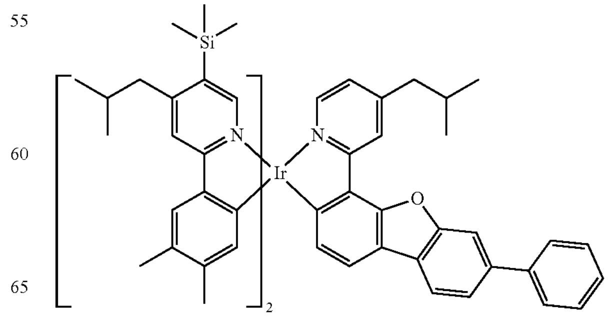

-continued
1406
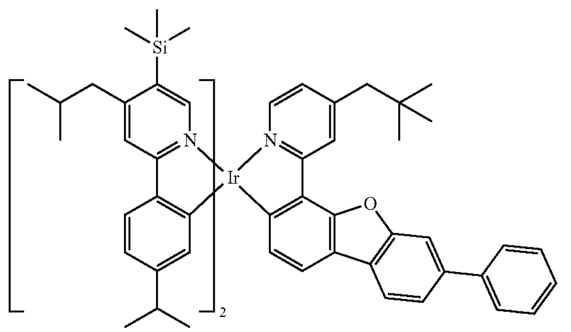
1407
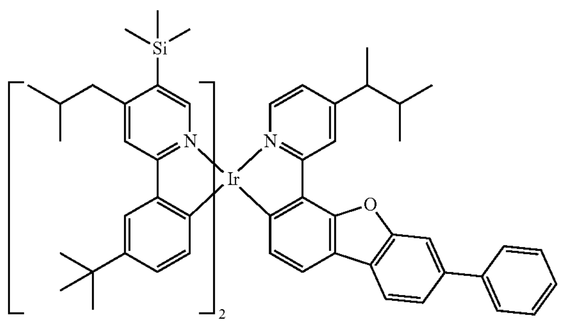
1408
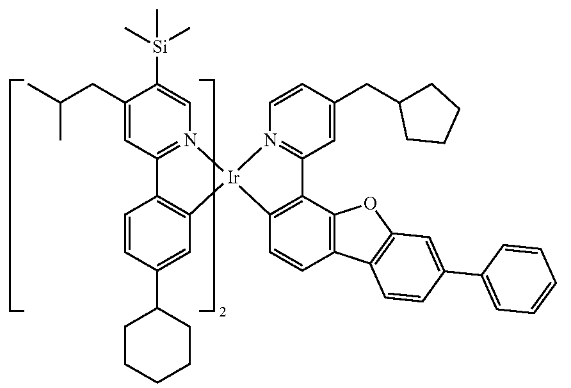
1409
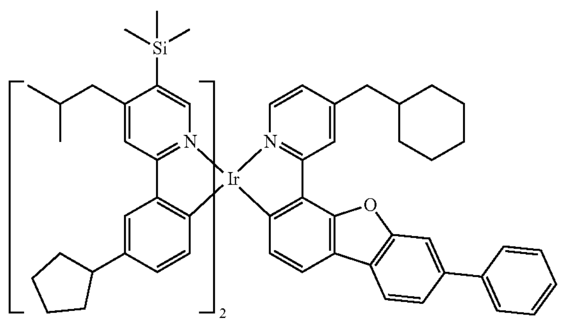
-continued
1410
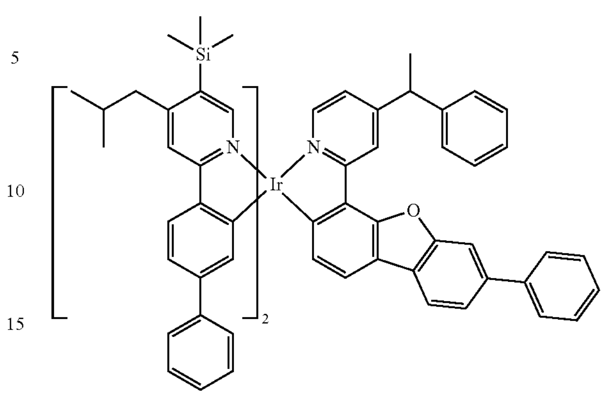
1411
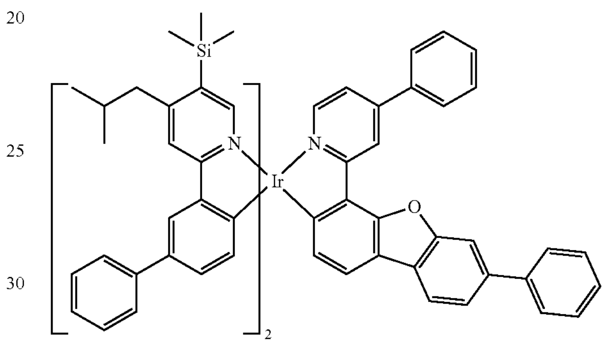
1412
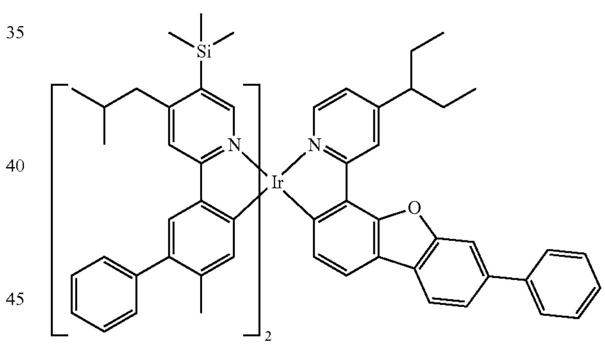
1413
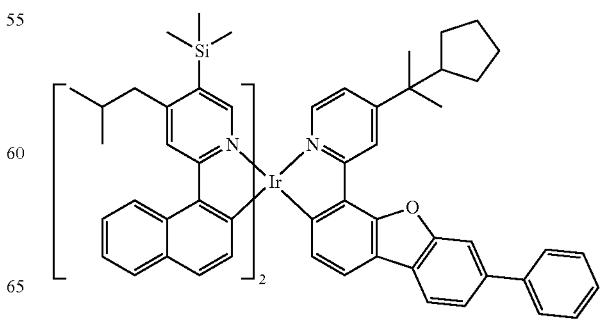

-continued
1414
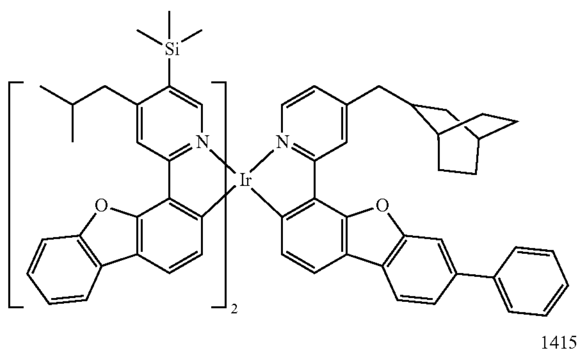
1415
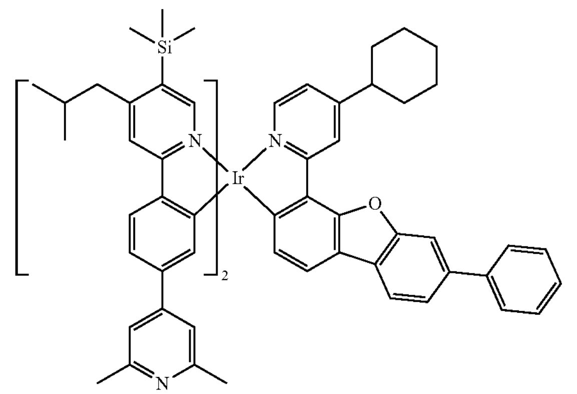
1416
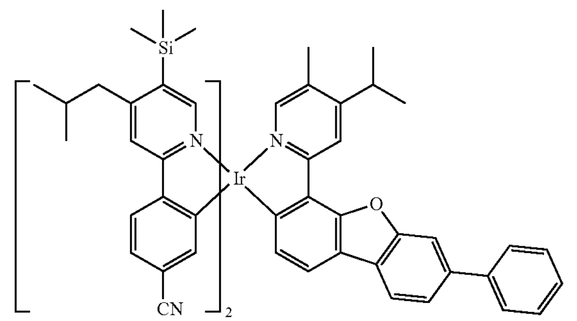
1417
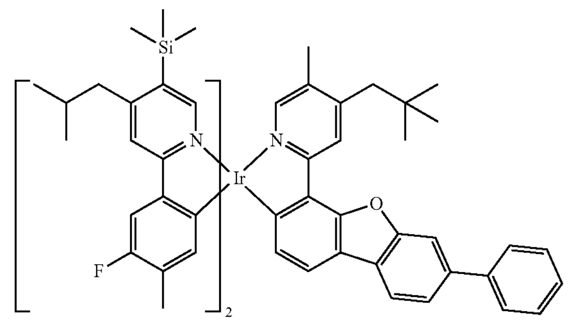
-continued
1418
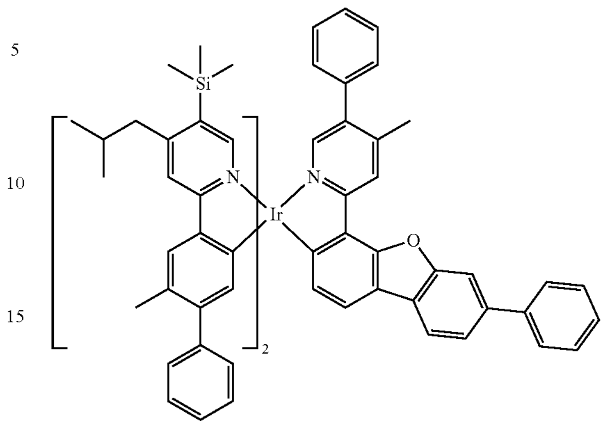
1419
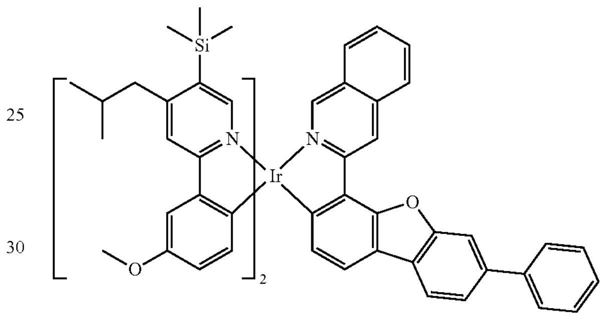
1420
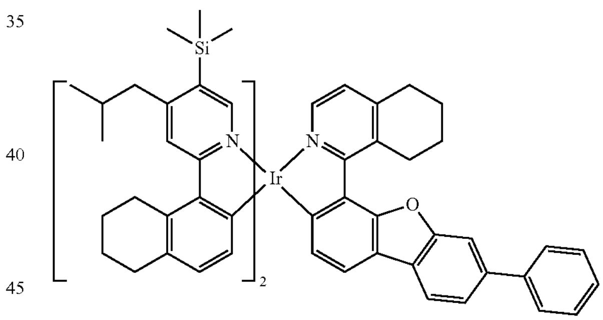
1421
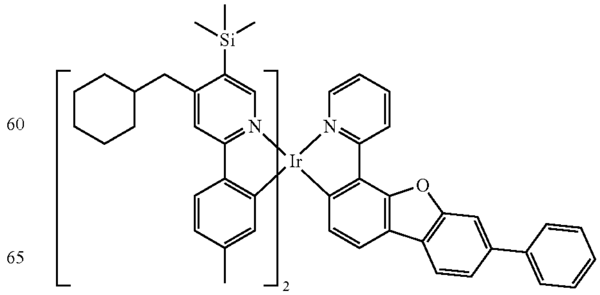

-continued
1422
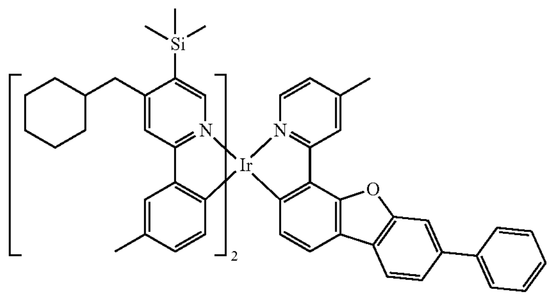
1423
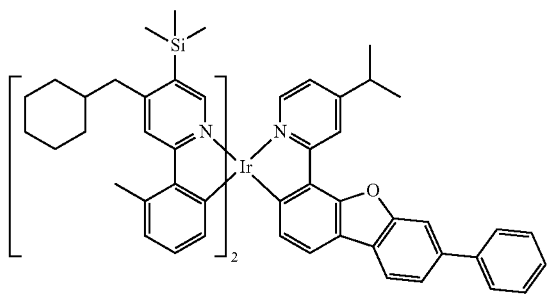
1424
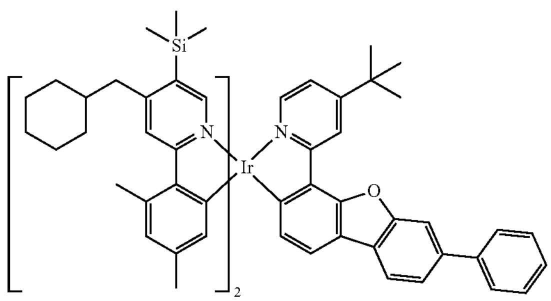
1425
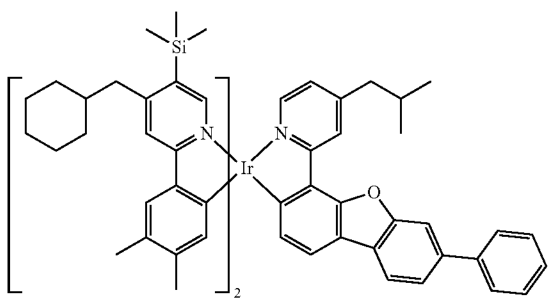
1426
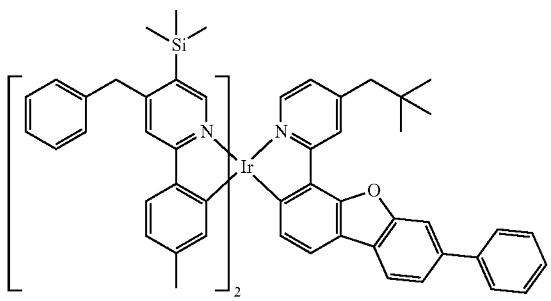
-continued
1427
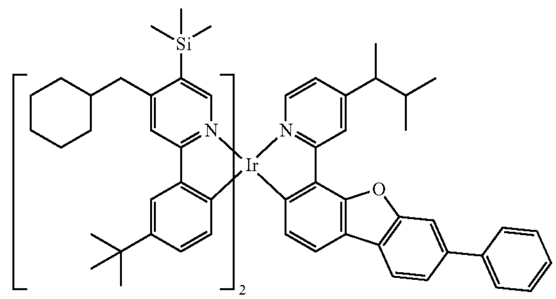
1428
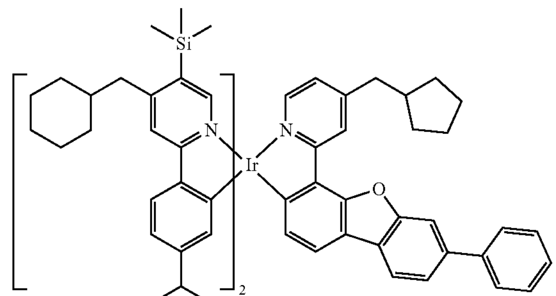
1429
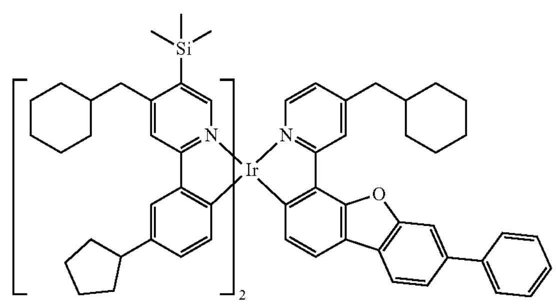
1430
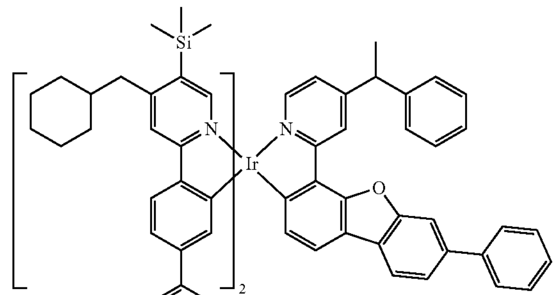

-continued
1431
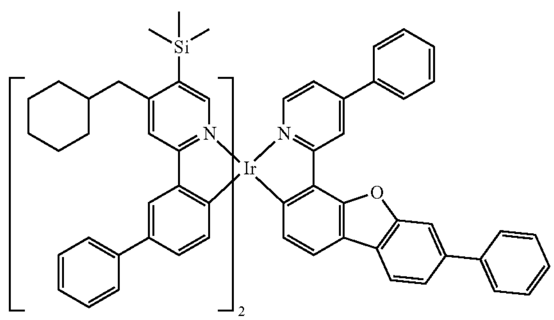
1432
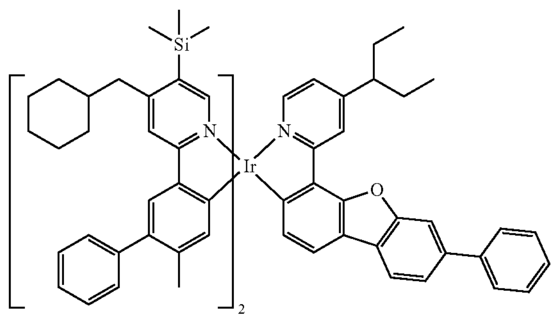
1433
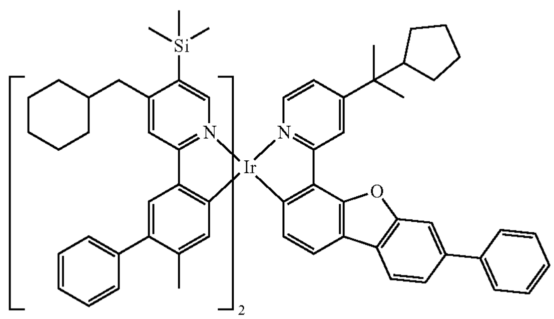
1434
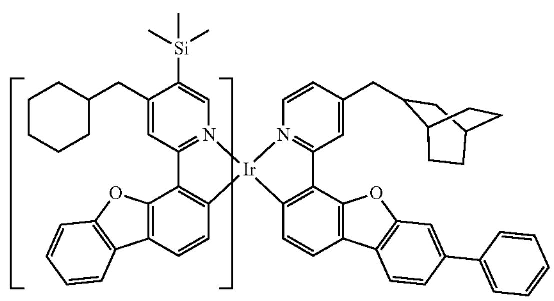
-continued
1435
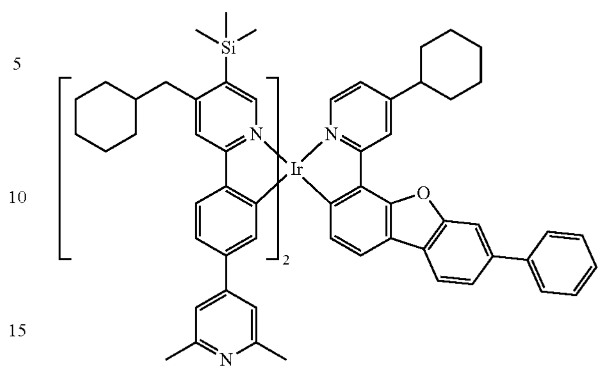
1436
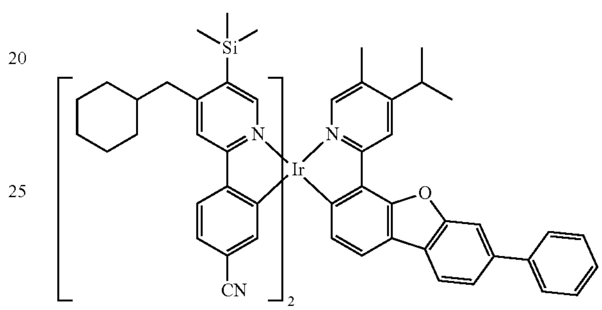
1437
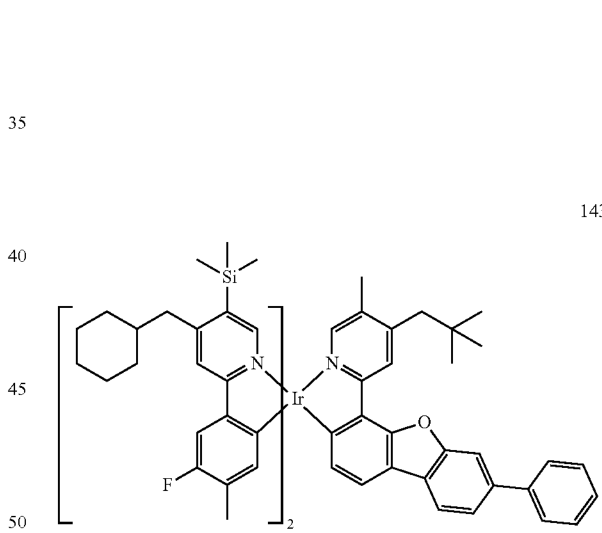
1438
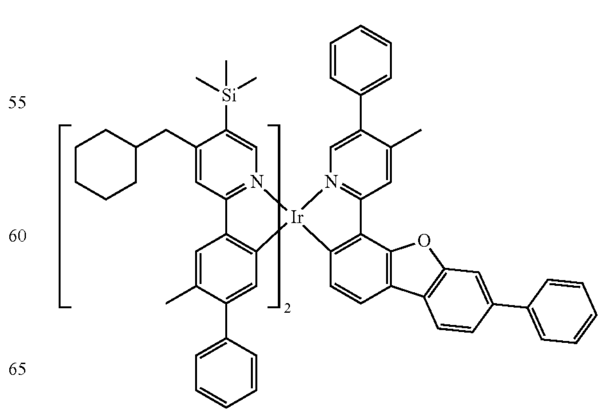

-continued
1439
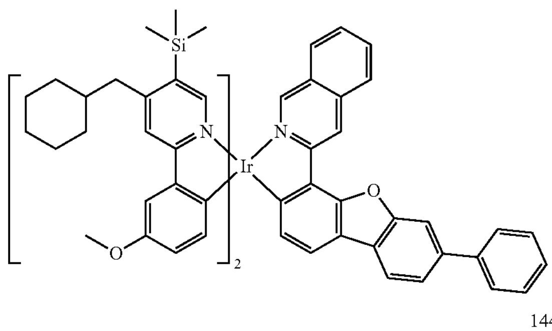
1440
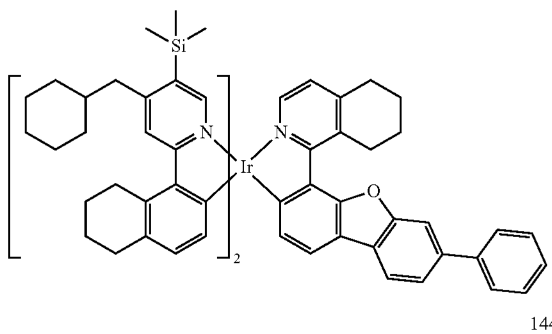
1441
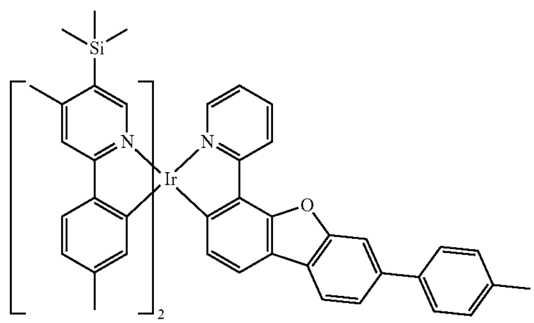
1442
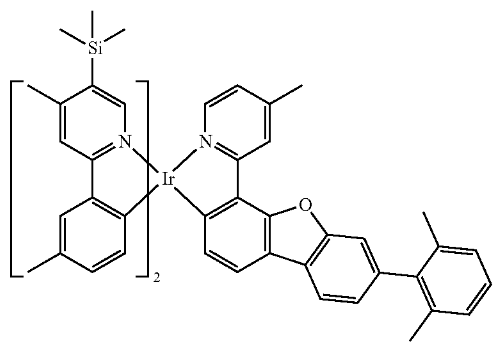
-continued
1443
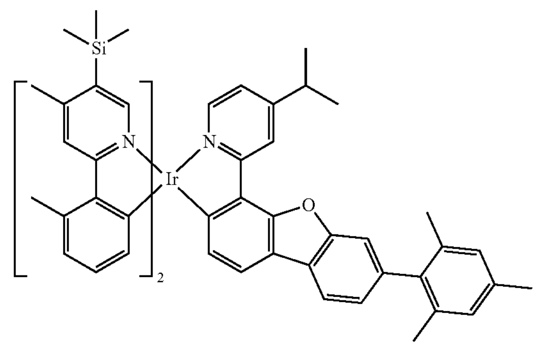
1444
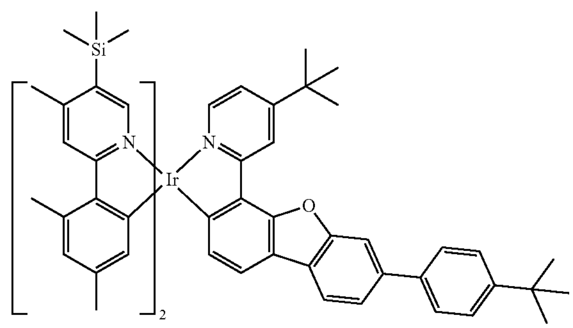
1445
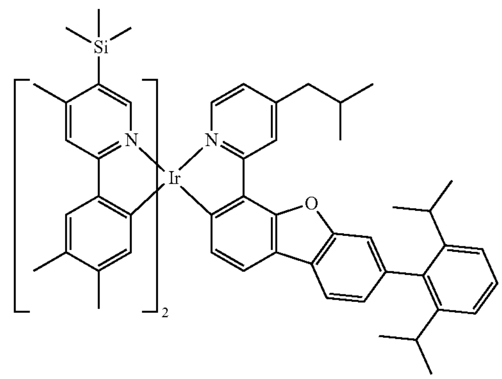
1446
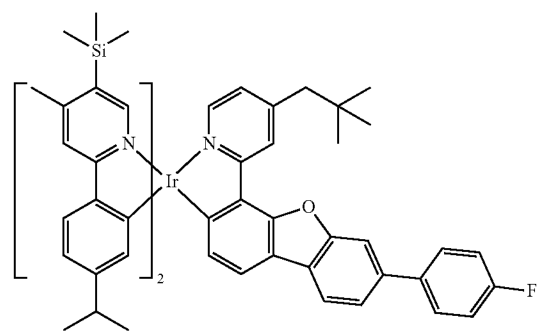

-continued
1447
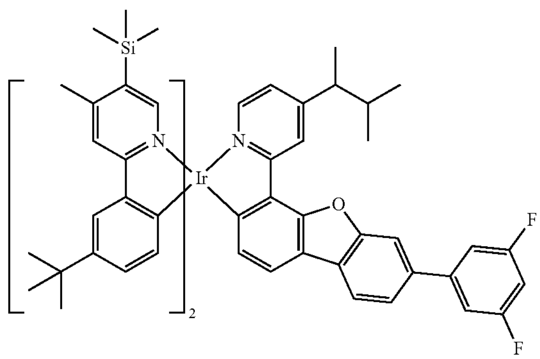
1448
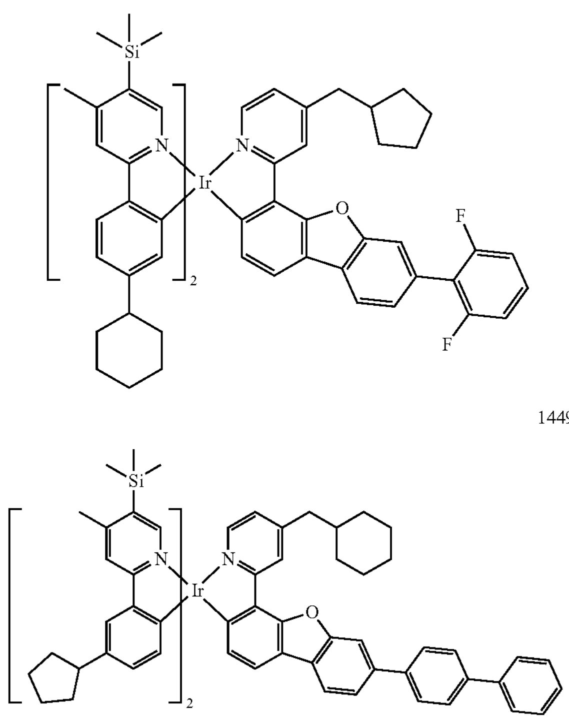
1449
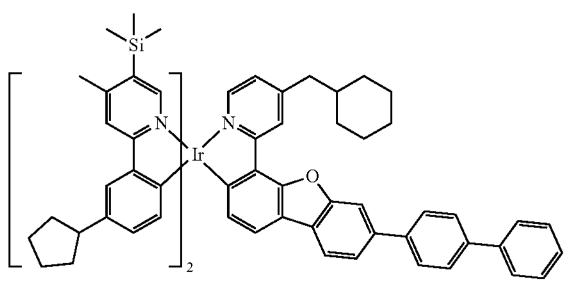
1450
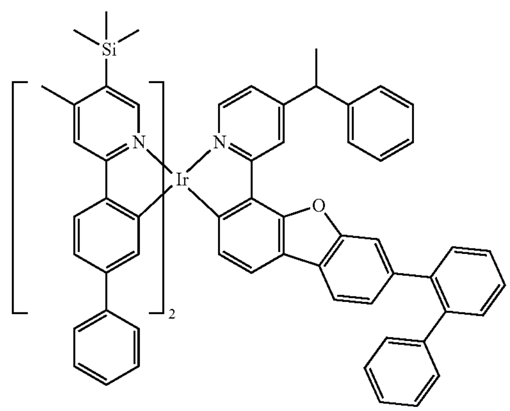
-continued
1451
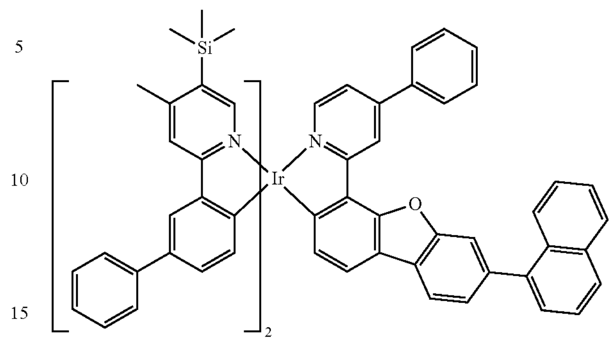
1452
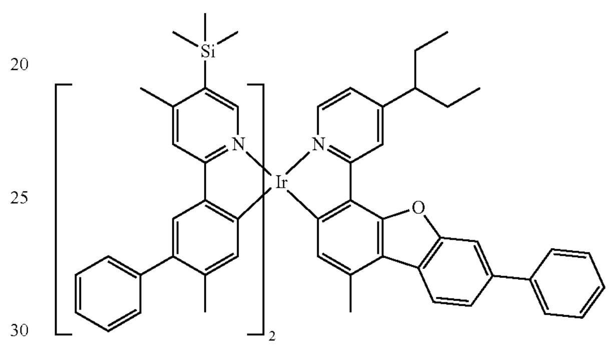
1453
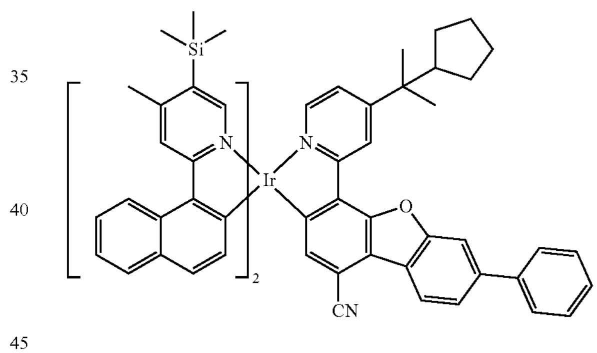
1454
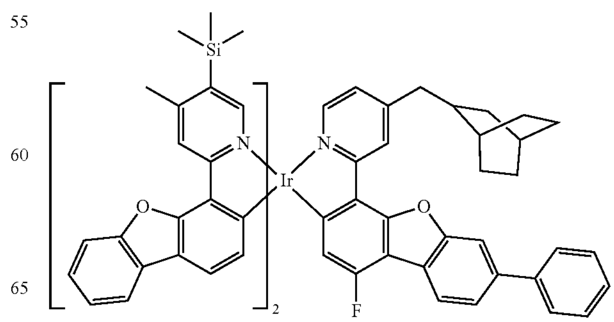

-continued
1455
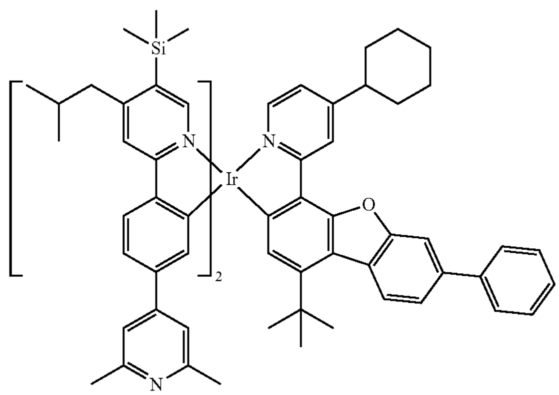
1456
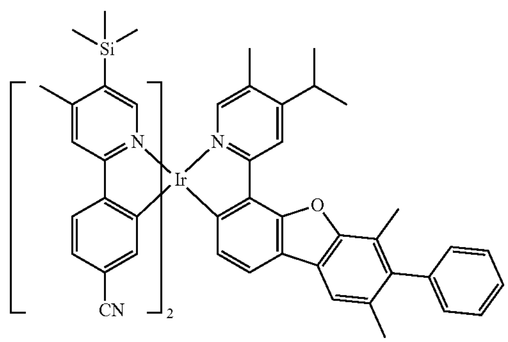
1457
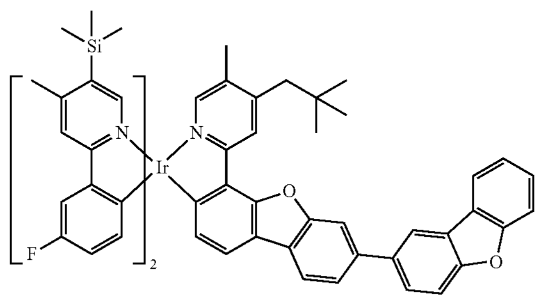
1458
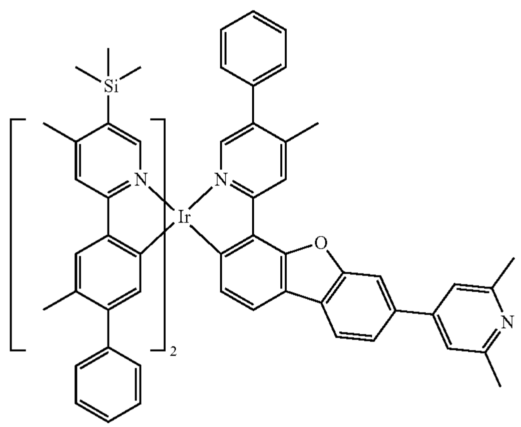
-continued
1459
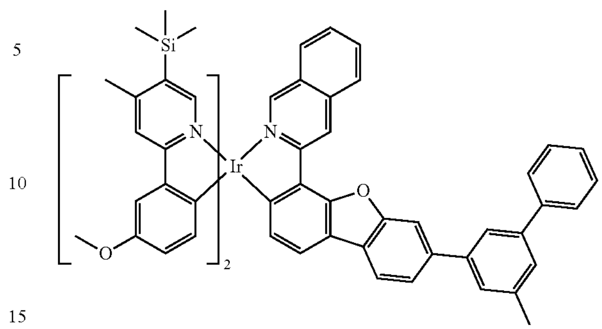
1460
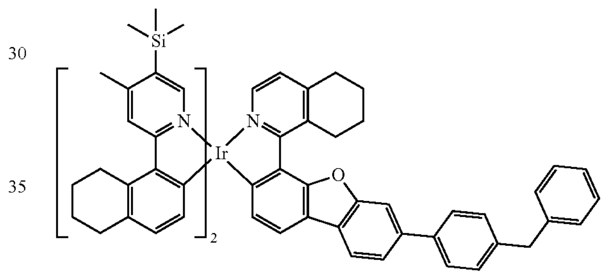
1461
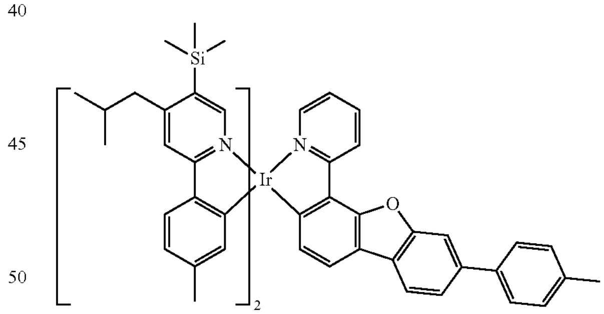
1462
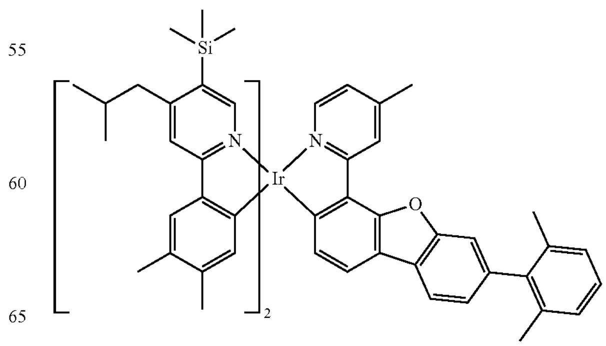

1463
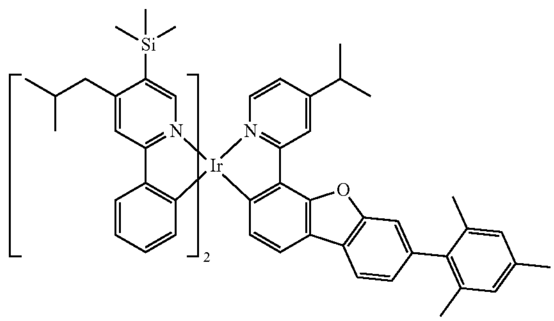
1464
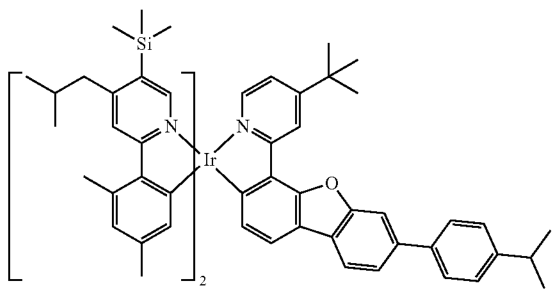
1465
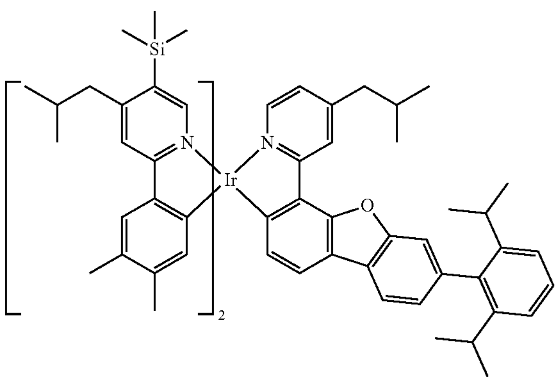
1466
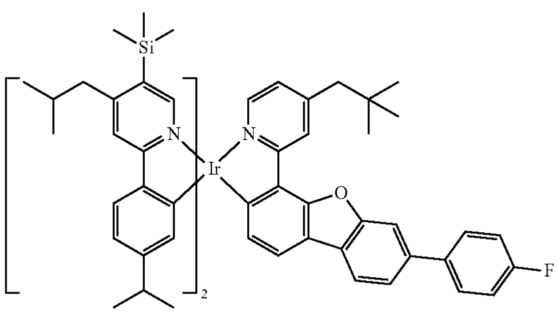
1467
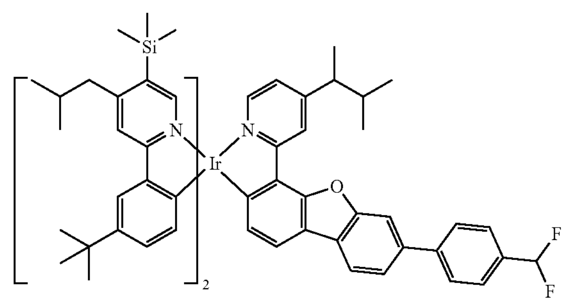
1468
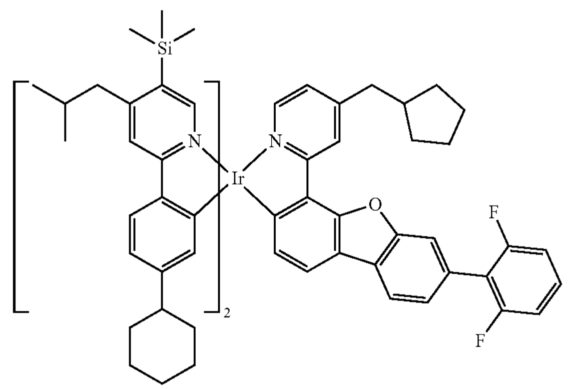
1469
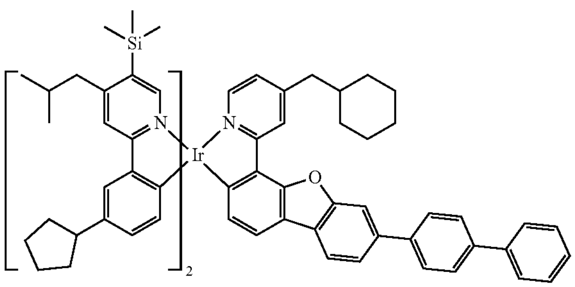
1470
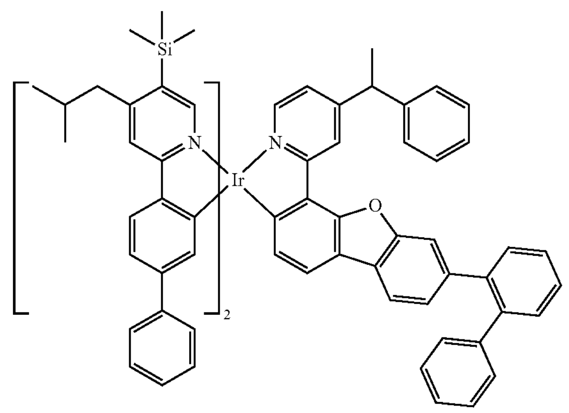

-continued
1471
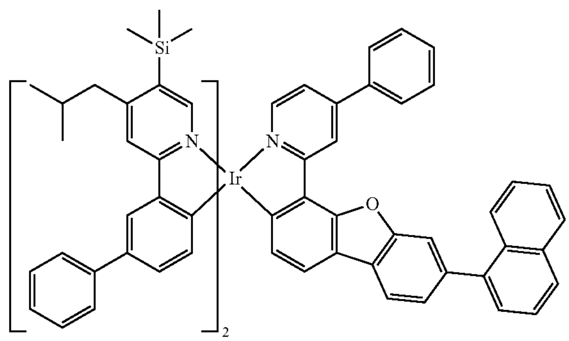
1472
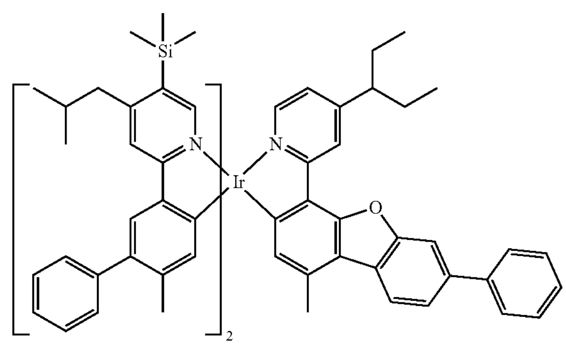
1473
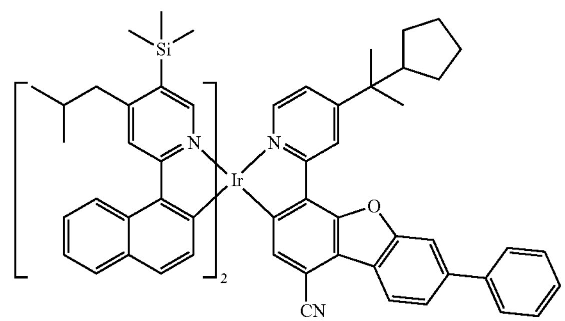
1474
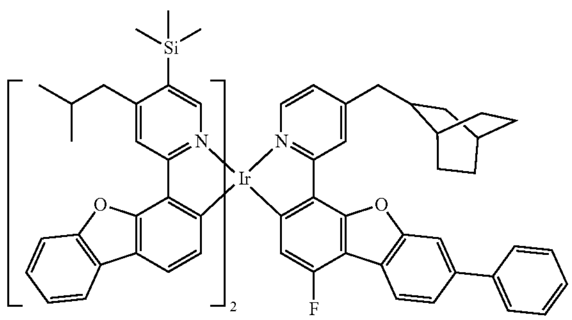
-continued
1475
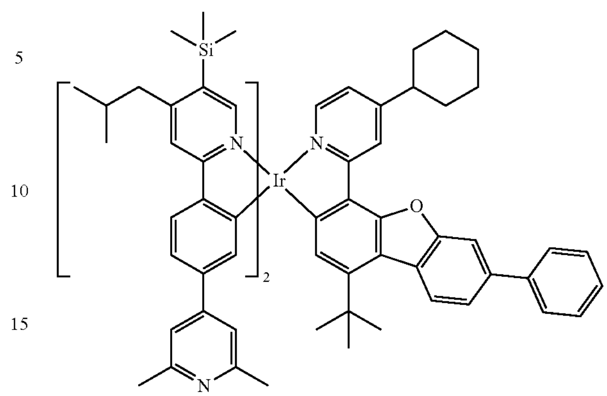
1476
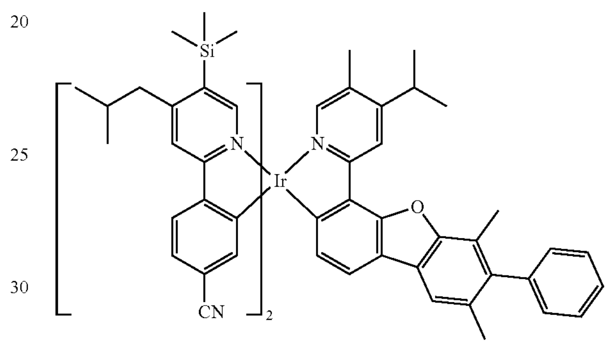
1477
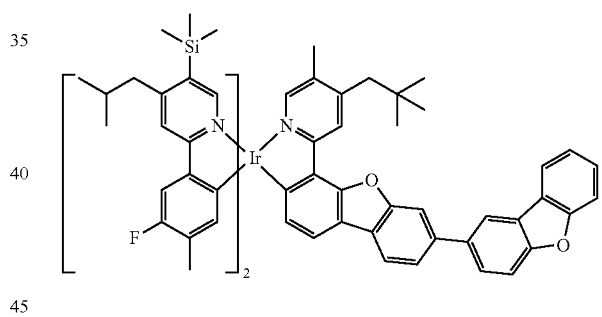
1478
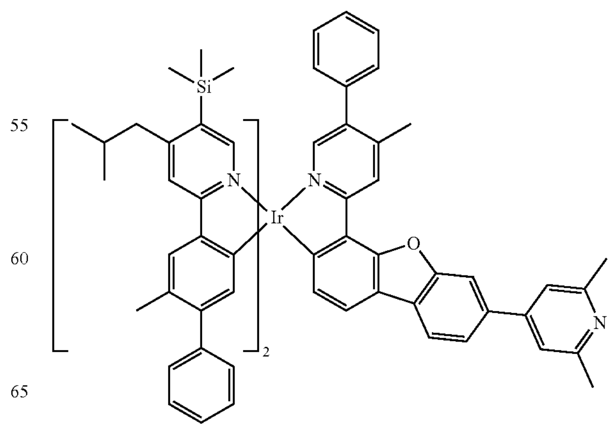

-continued
1479
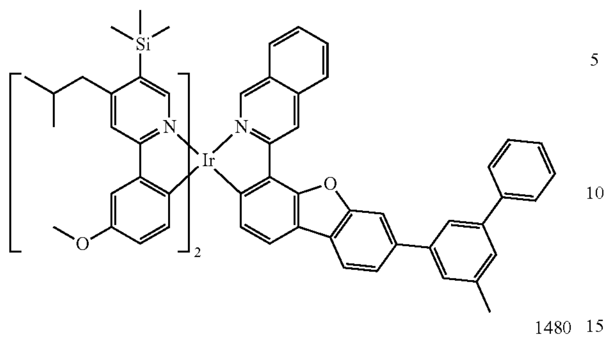
1480
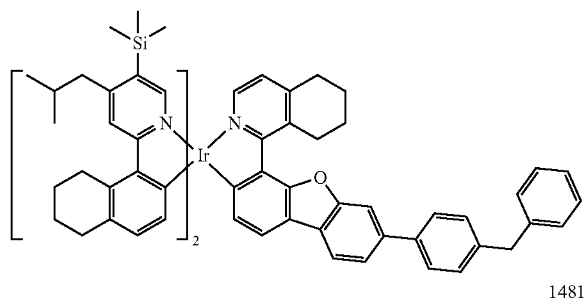
1481
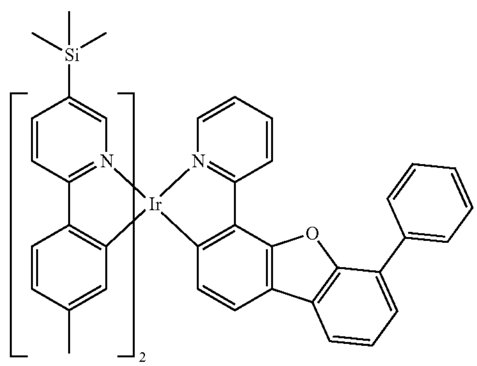
-
1482
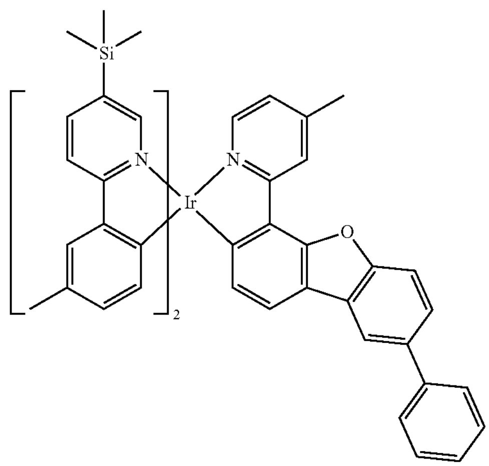
-continued
1483
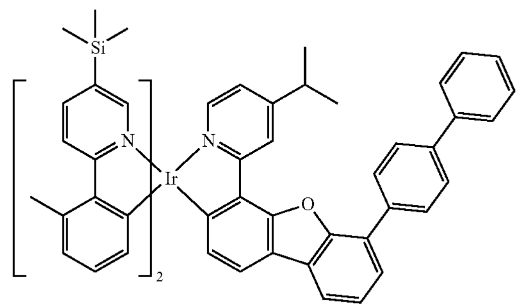
1484
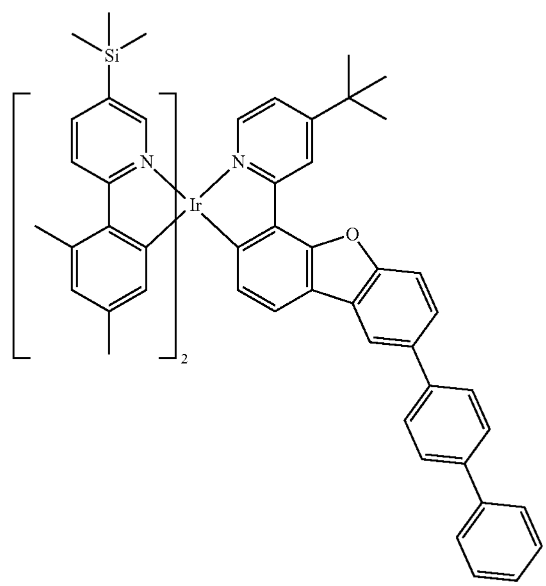
1485
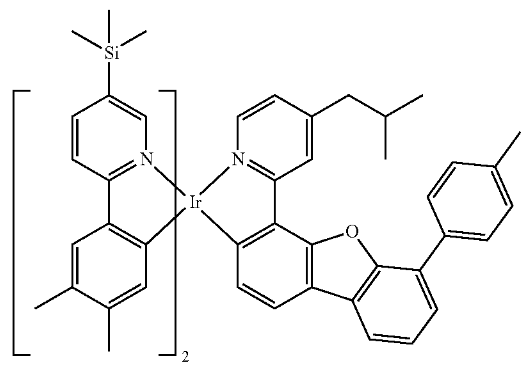

1486
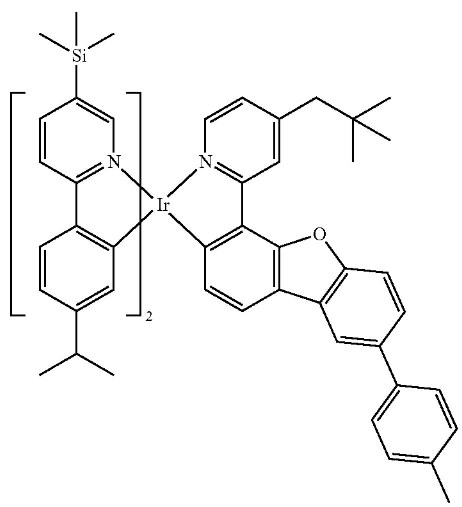
1487
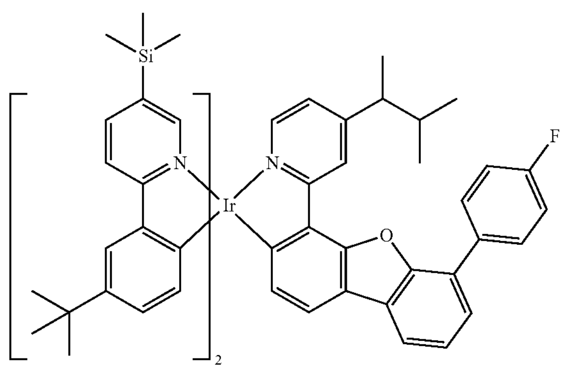
1488
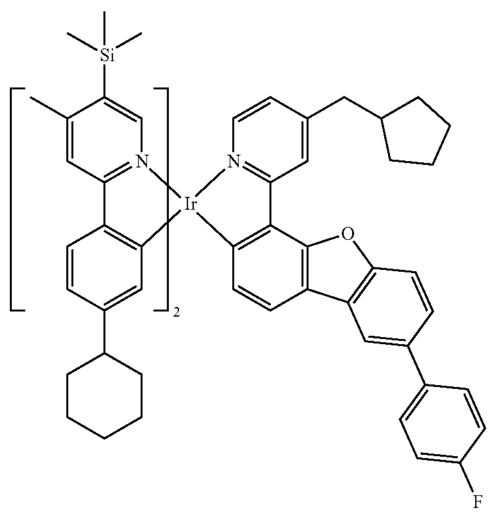
1489
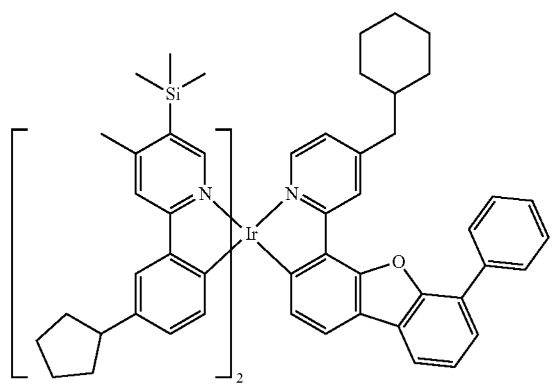
1490
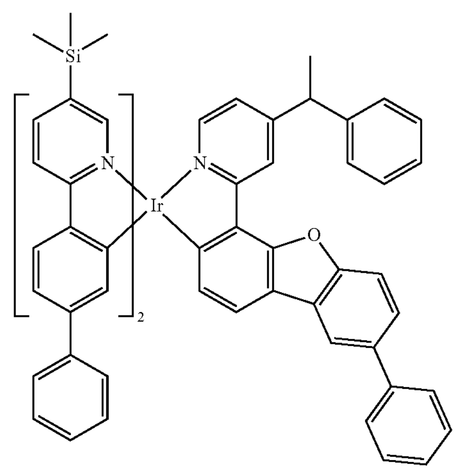
1491
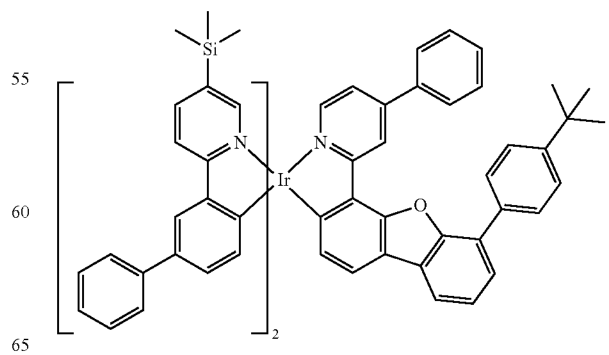

-continued
1492
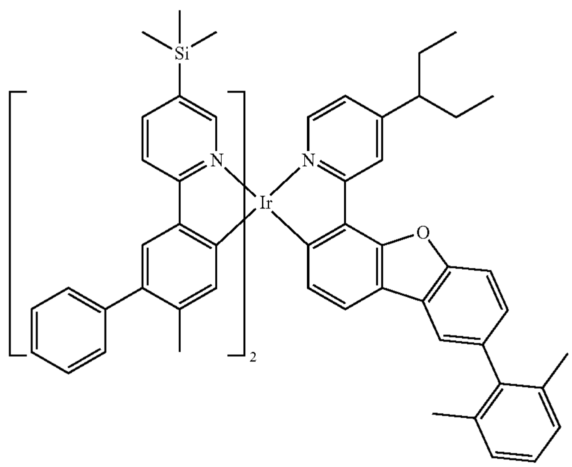
1493
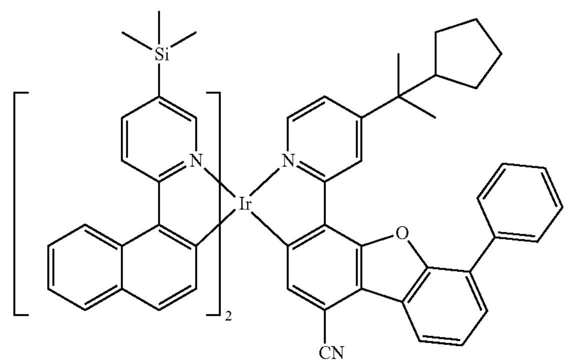
1494
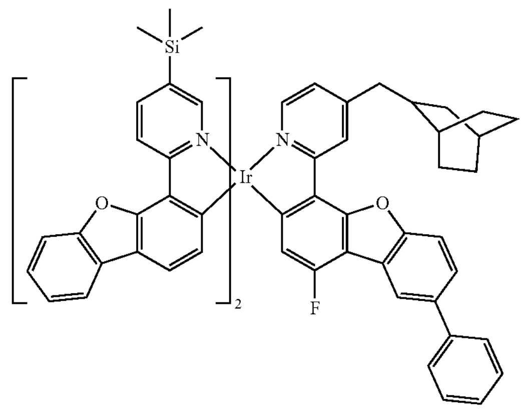
-continued
1495
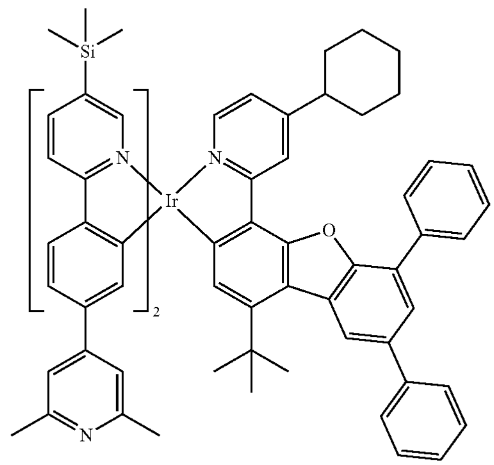
1496
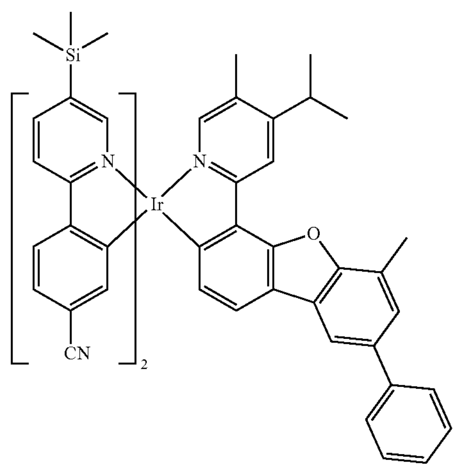
1497
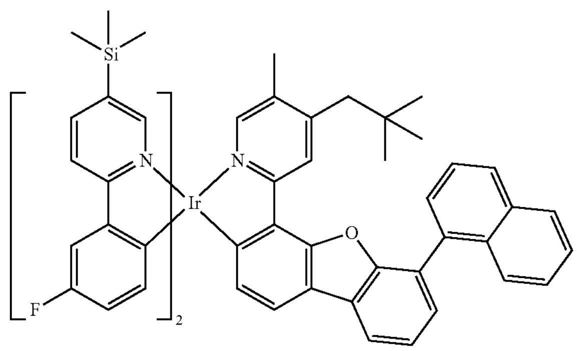

-continued
1498
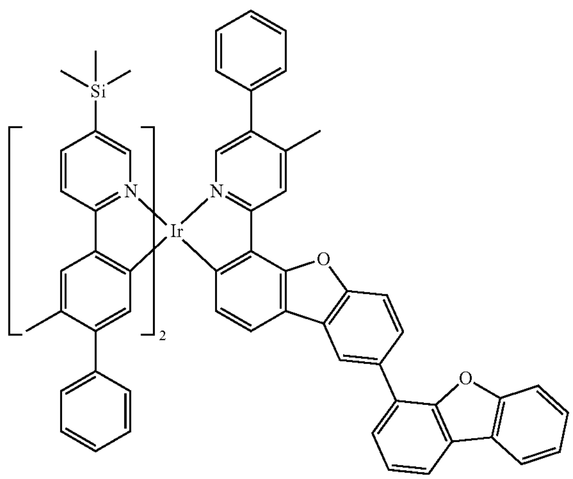
1499
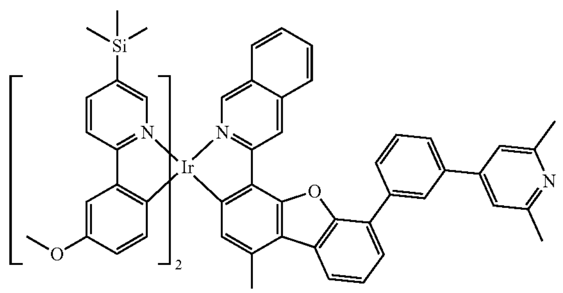
1500
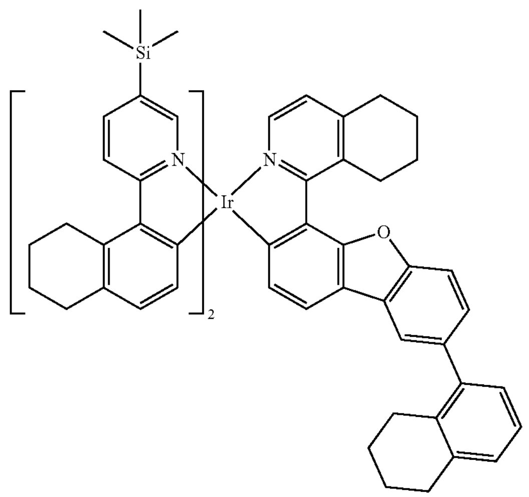
-continued
1501
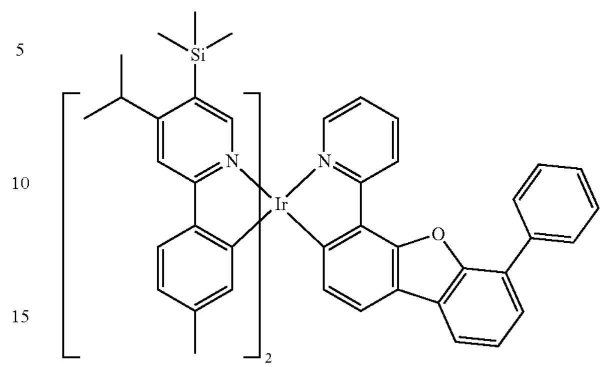
1502
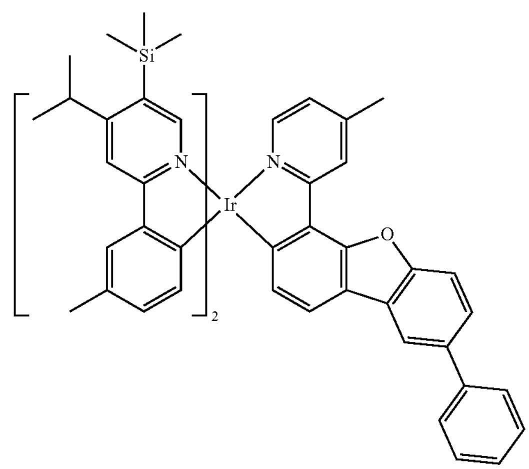
1503
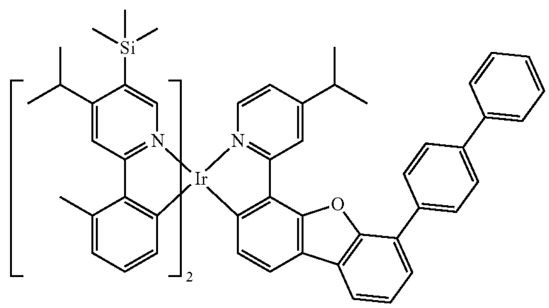

-continued
1504
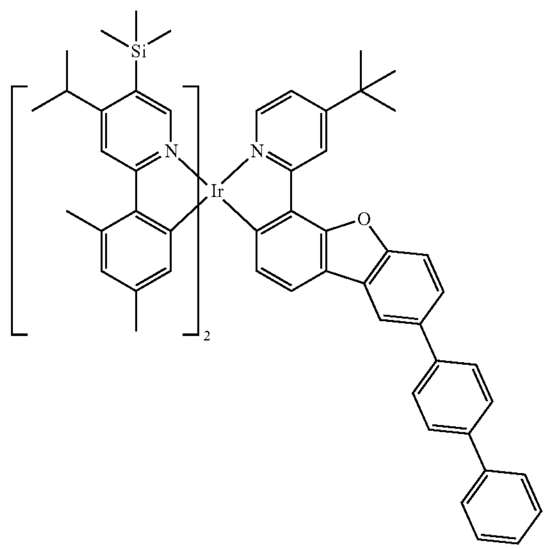
1505
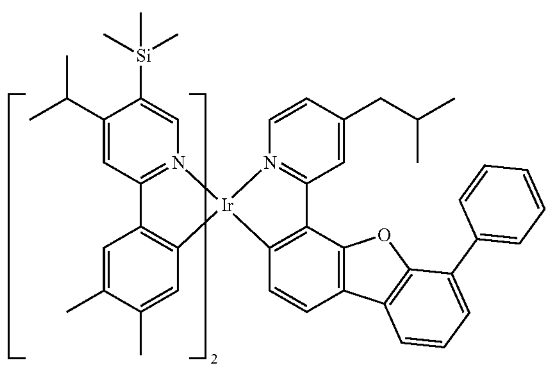
1506
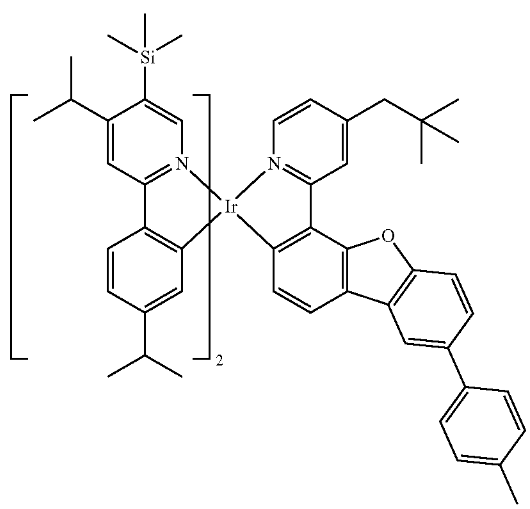
-continued
1507
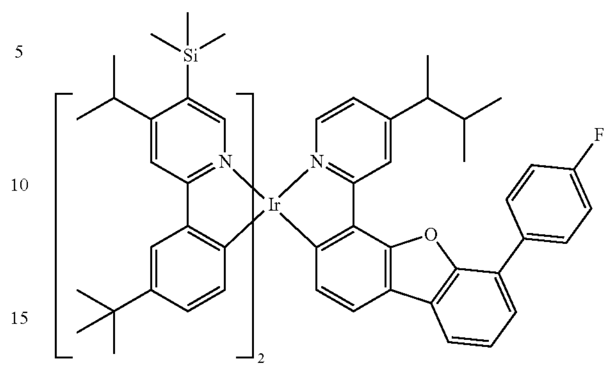
1508
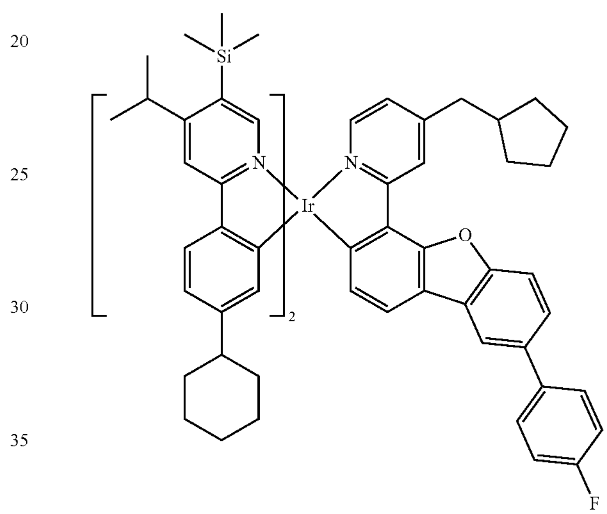
1509
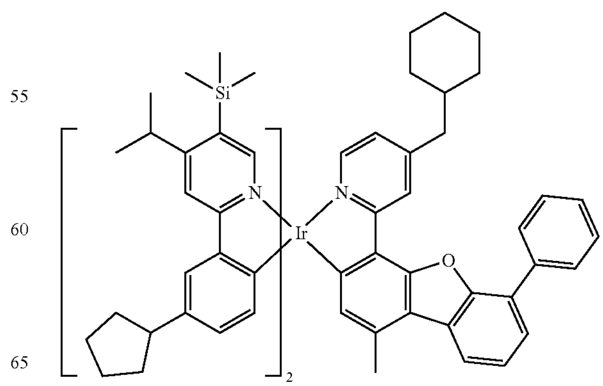

-continued
1510
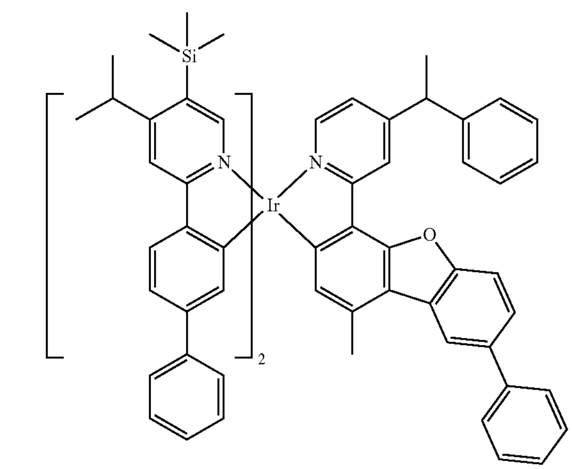
1511
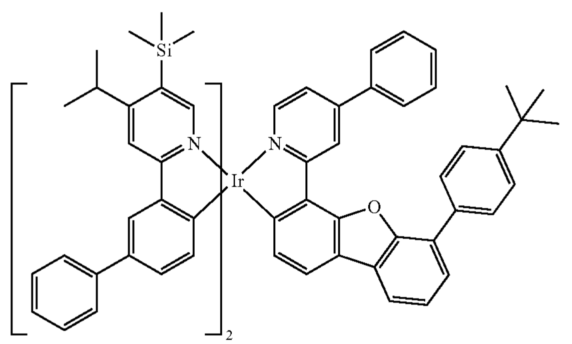
1512
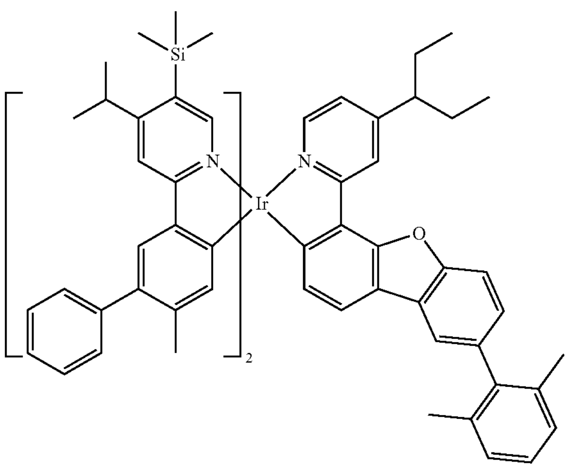
-continued
1513
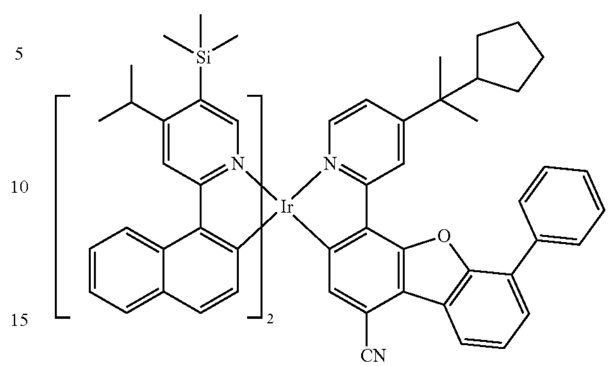
1514
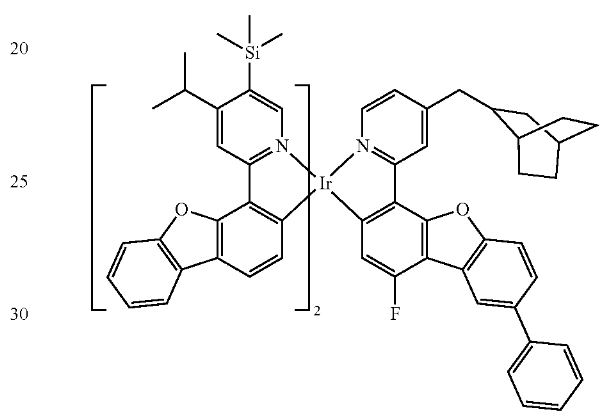
1515
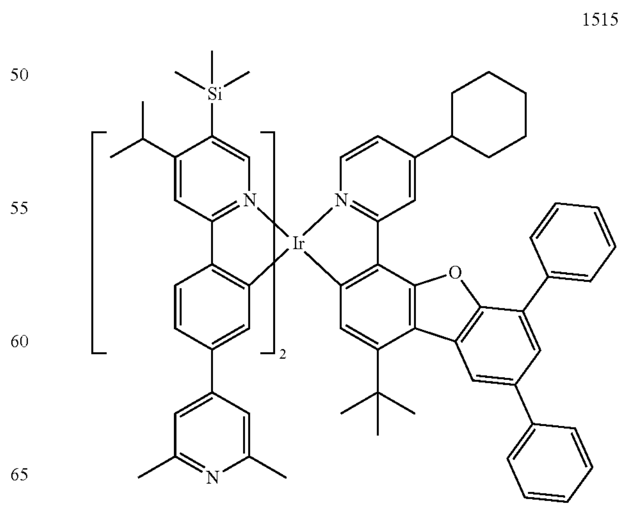

-continued
1516
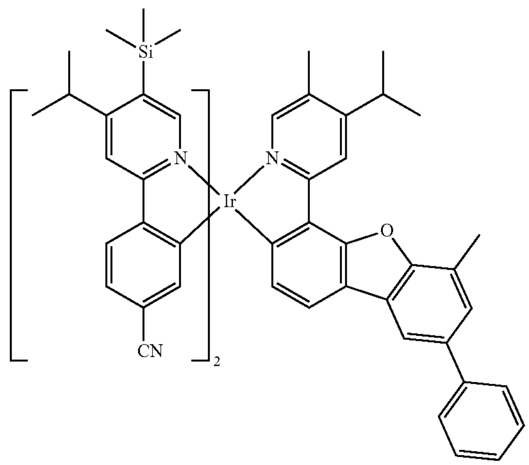
1517
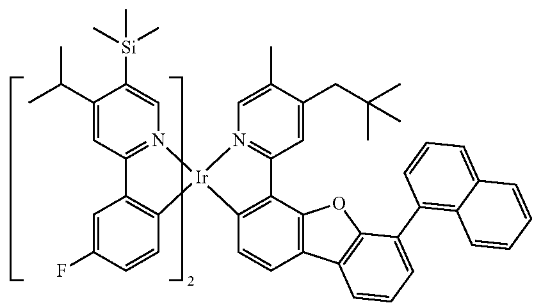
1518
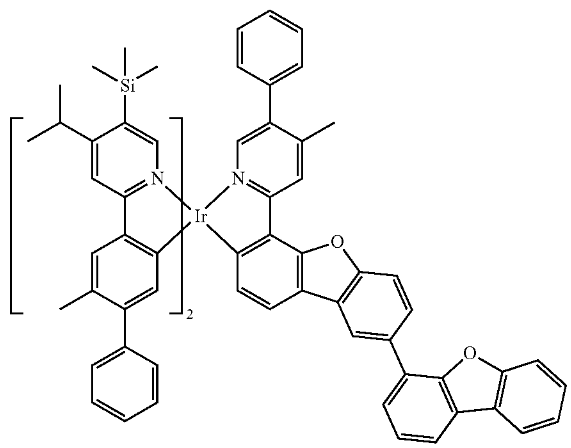
1519
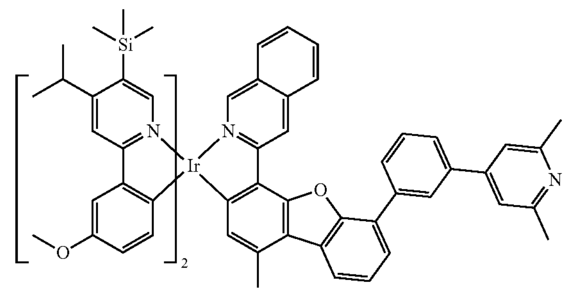
-continued
1520
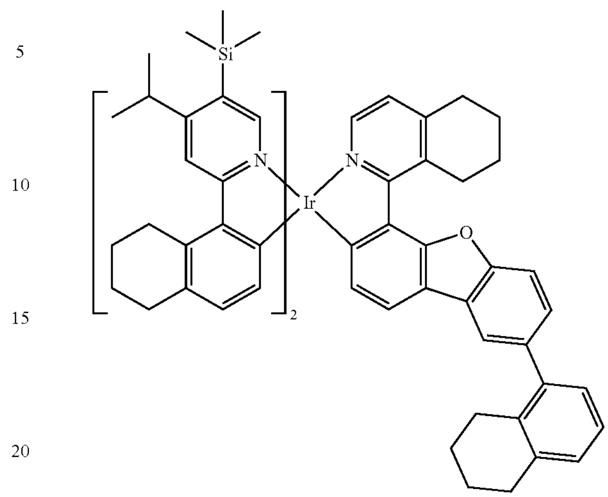
1521
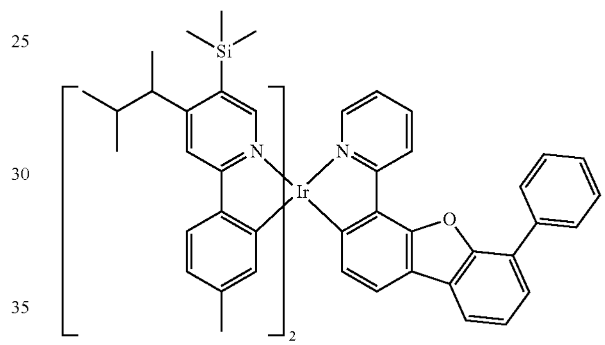
1522
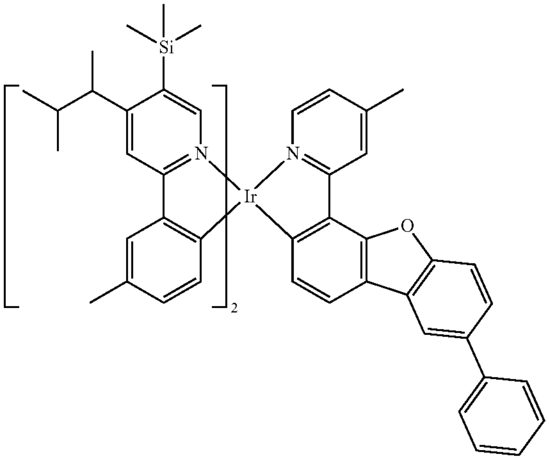

-continued
1523
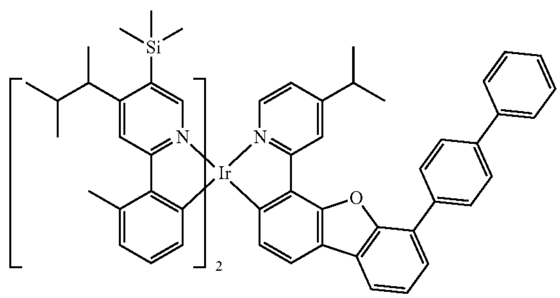
1524
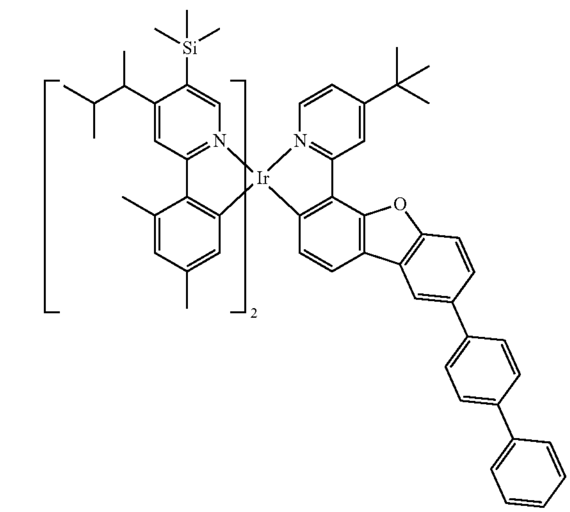
1525
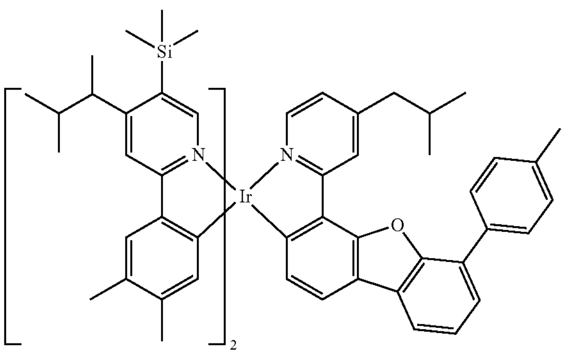
-continued
1526
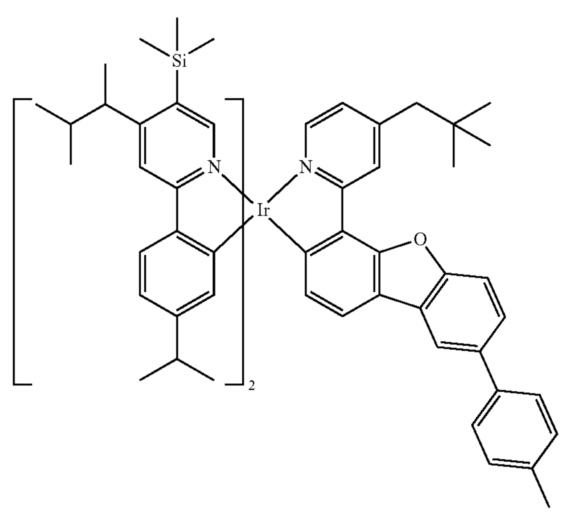
1527
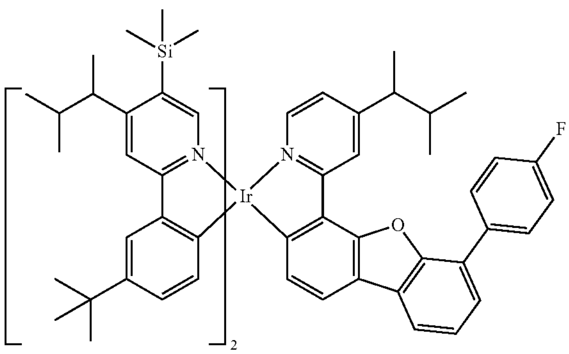
1528
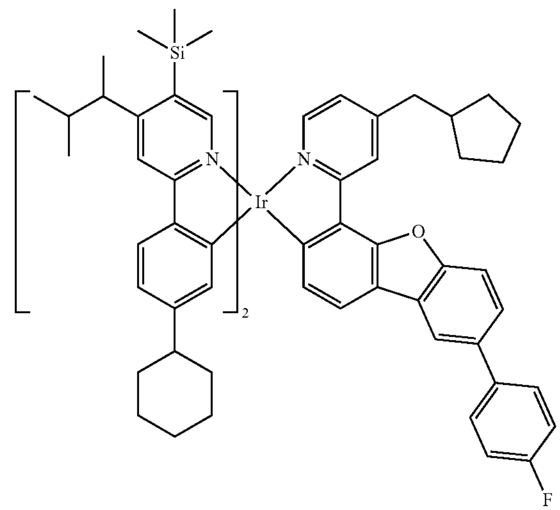

-continued
1529
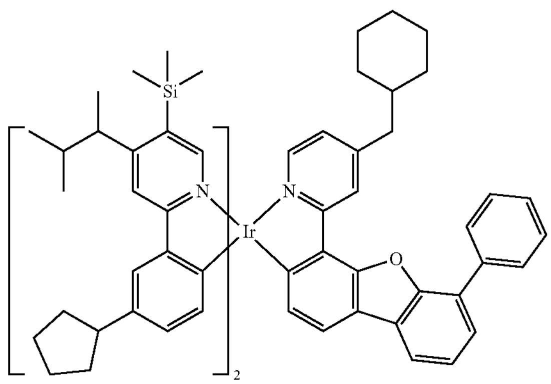
1530
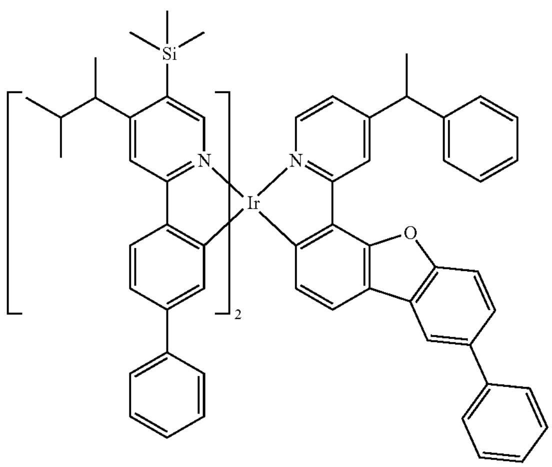
1531
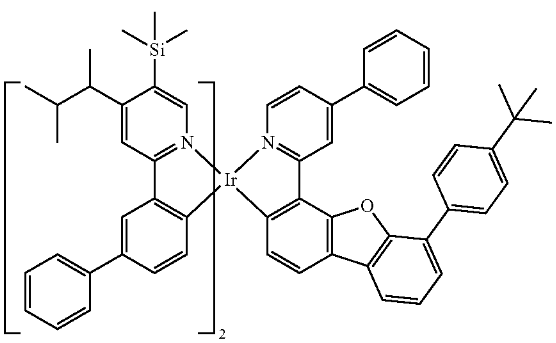
-continued
1532
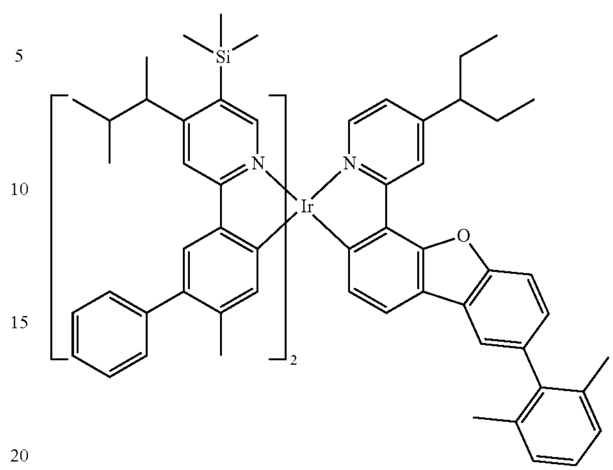
1533
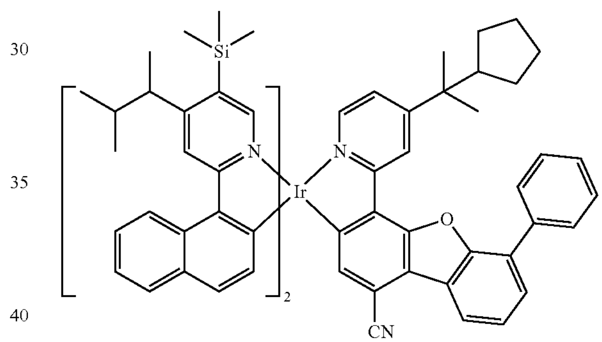
1534
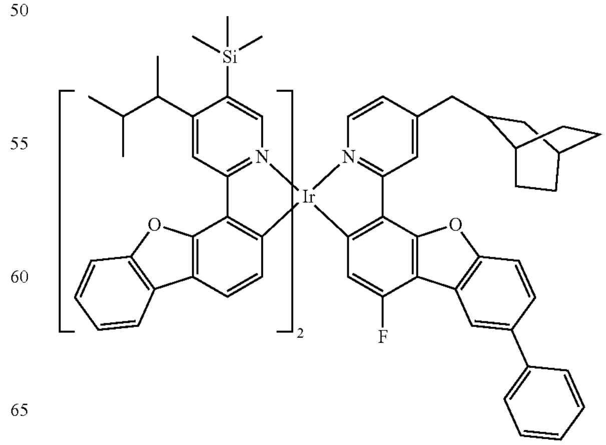

-continued
1535
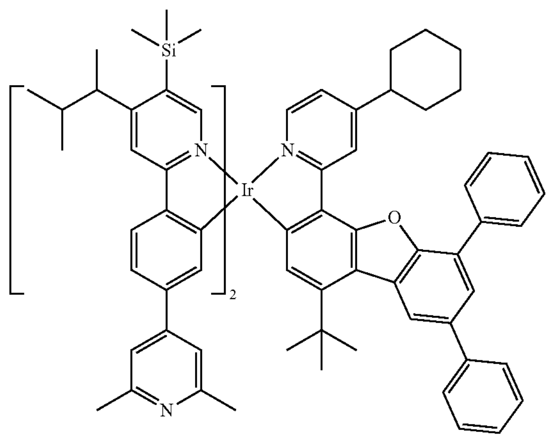
1536
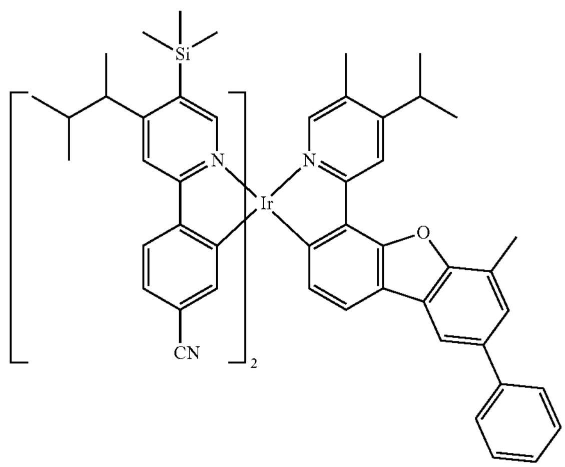
1537
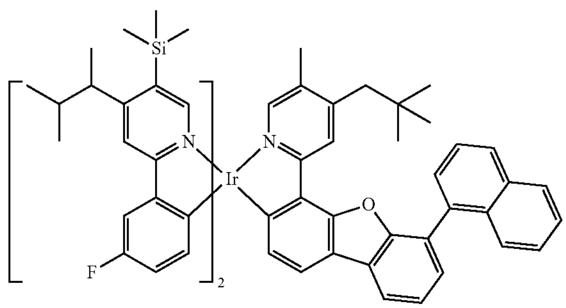
-continued
1538
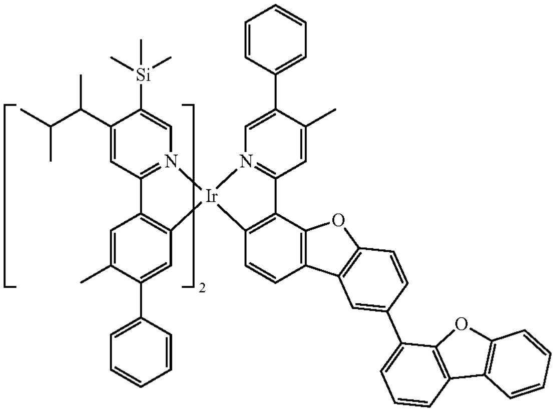
1539
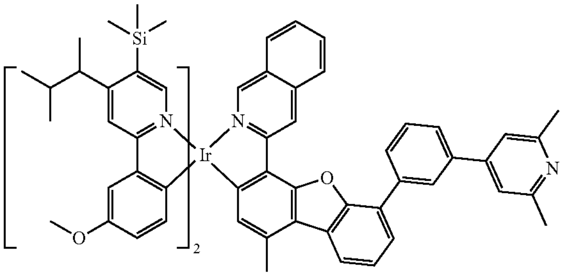
1540
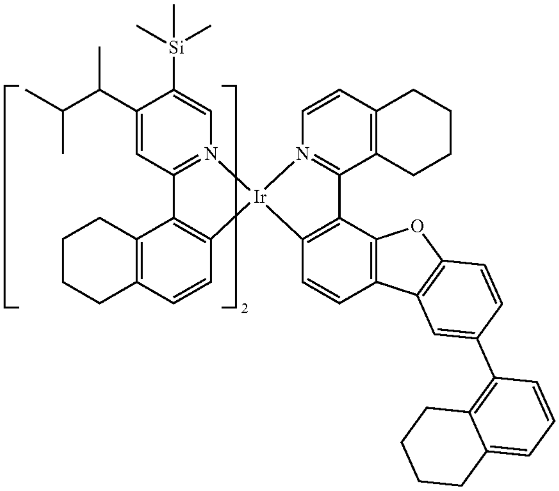

-continued
1541
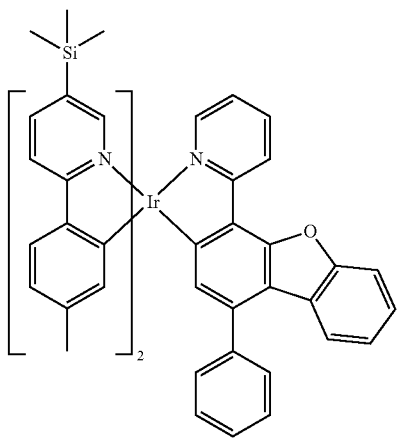
1542
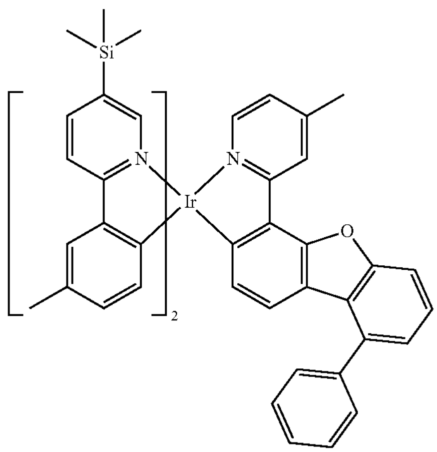
1543
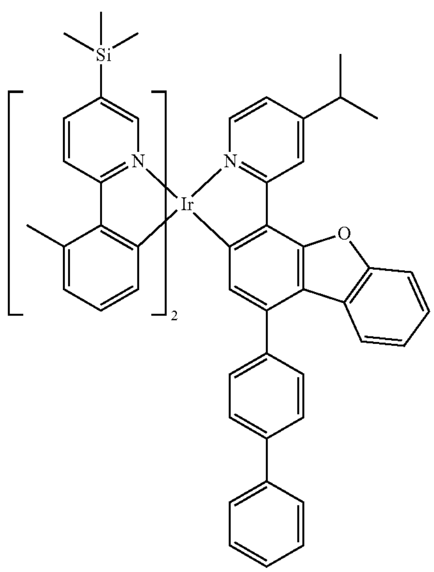
-continued
1544
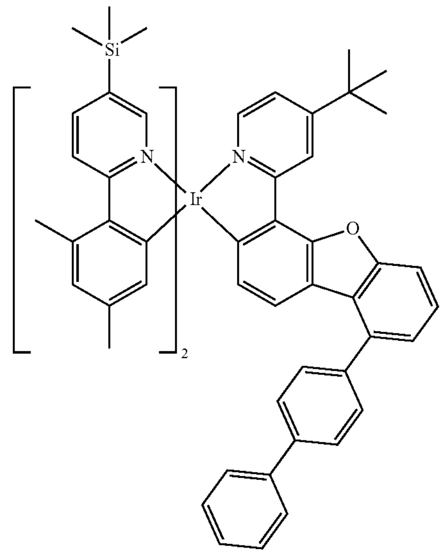
1545
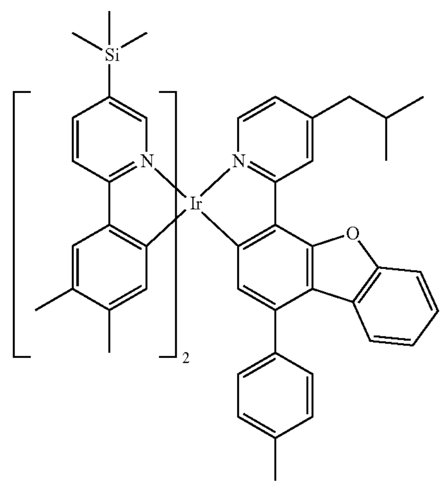
1546
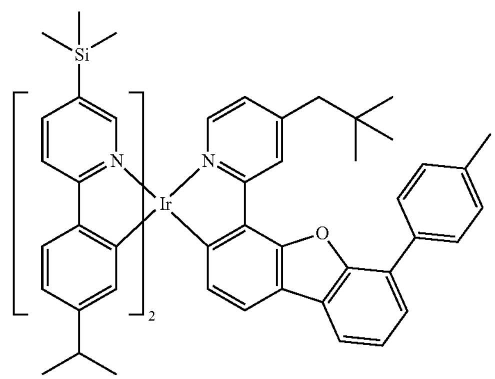

-continued
1547
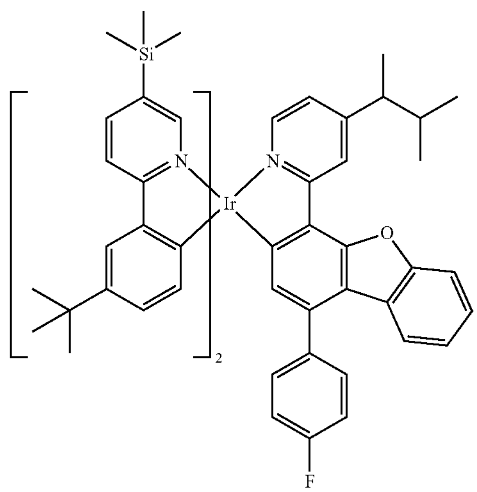
1548
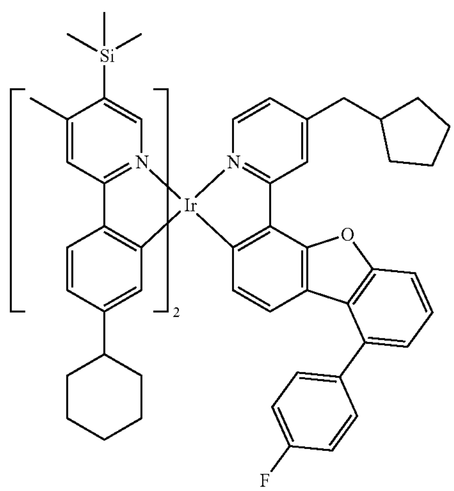
1549
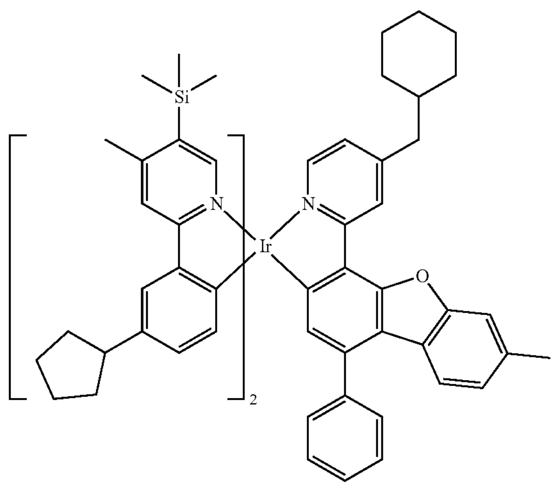
-continued
1550
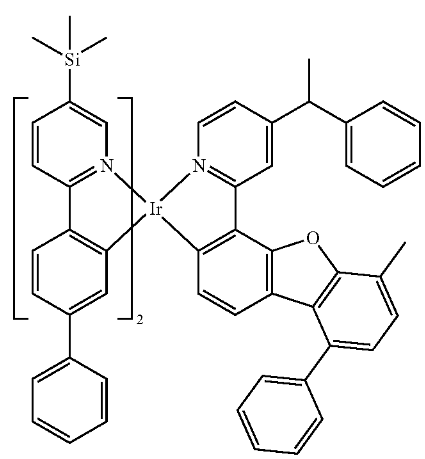
1551
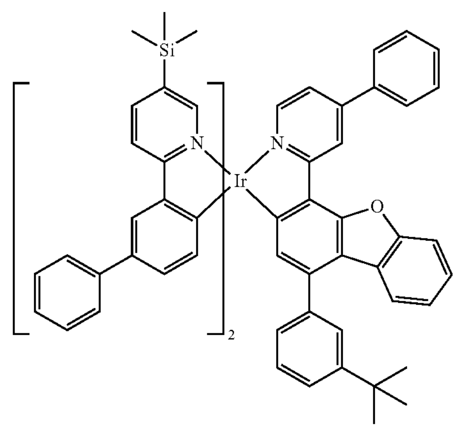
1552
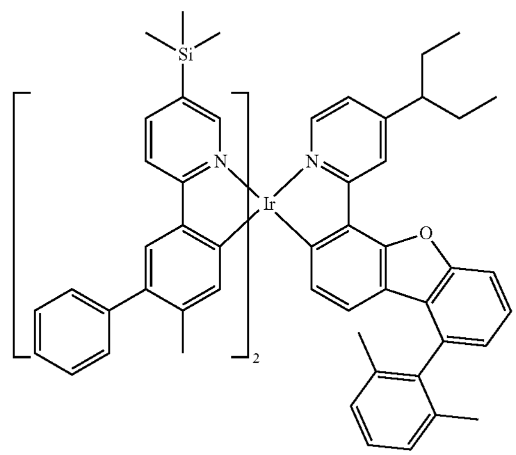

-continued
1553
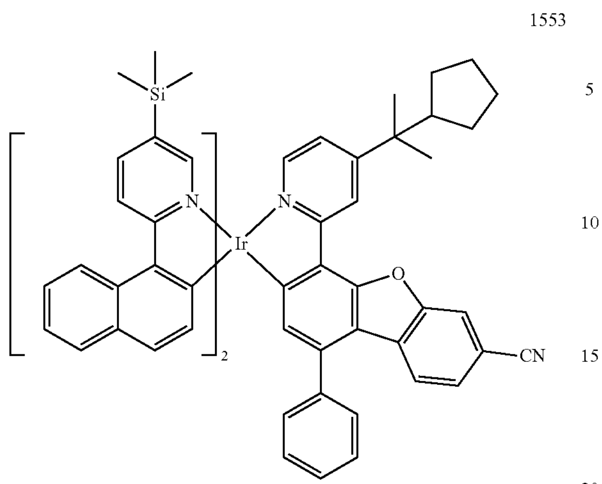
1554
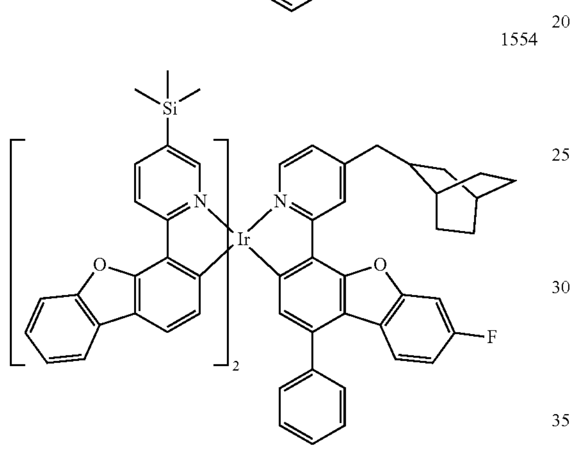
1555
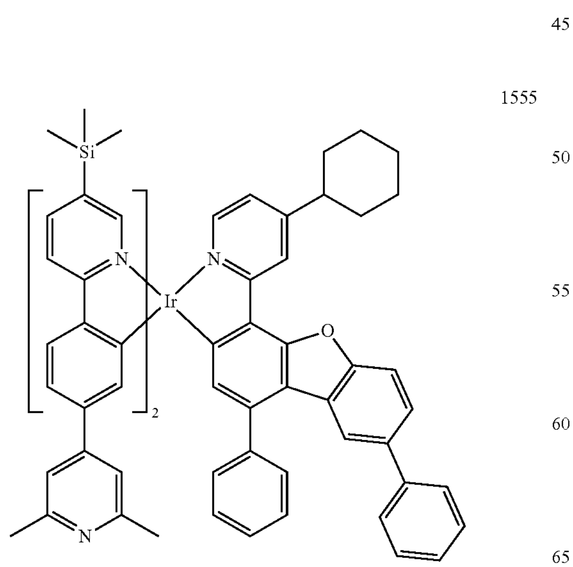
-continued
1556
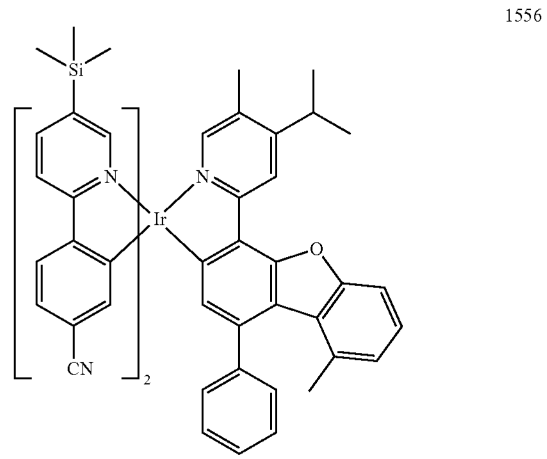
1557
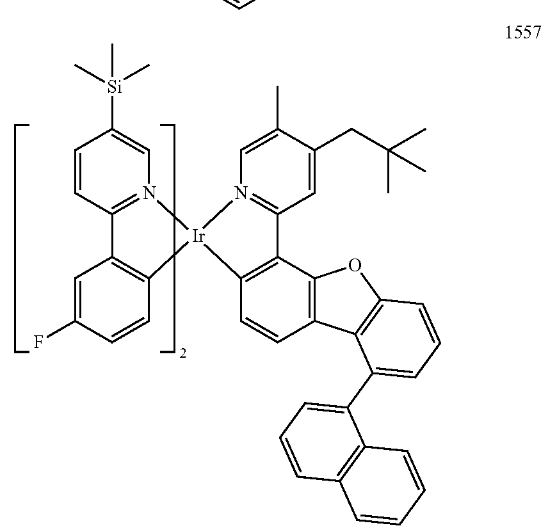
1558
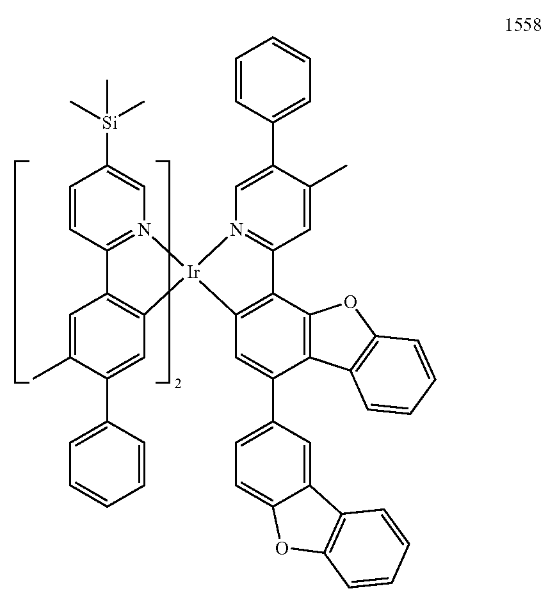

1559
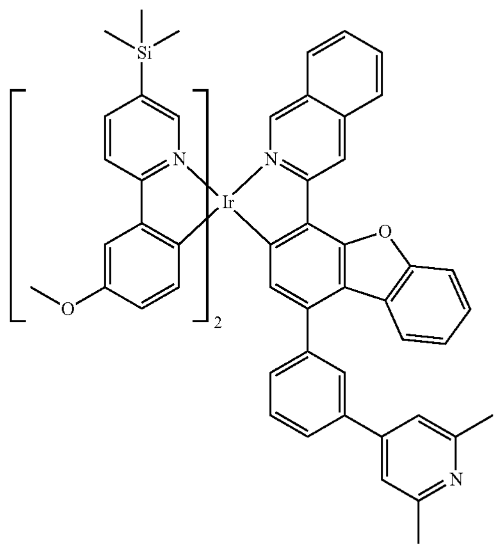
1560
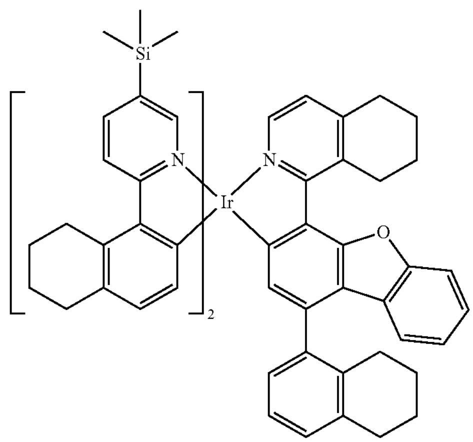
1561
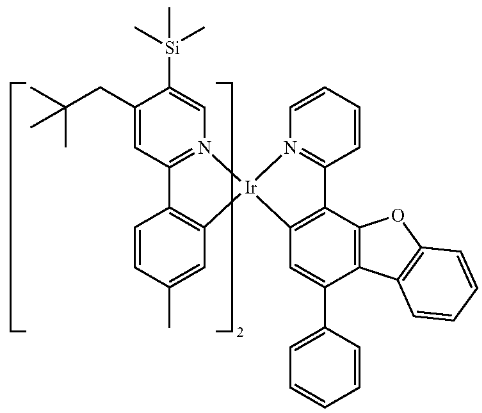
1562
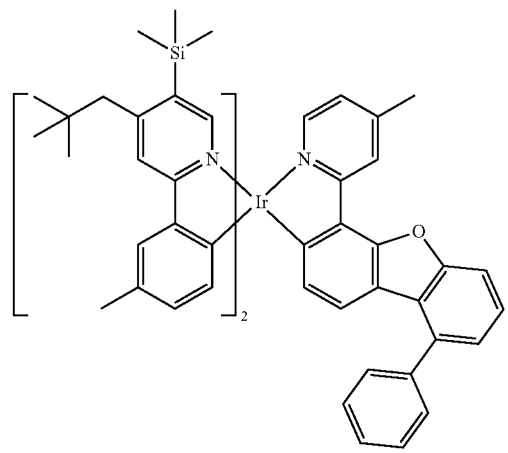
1563
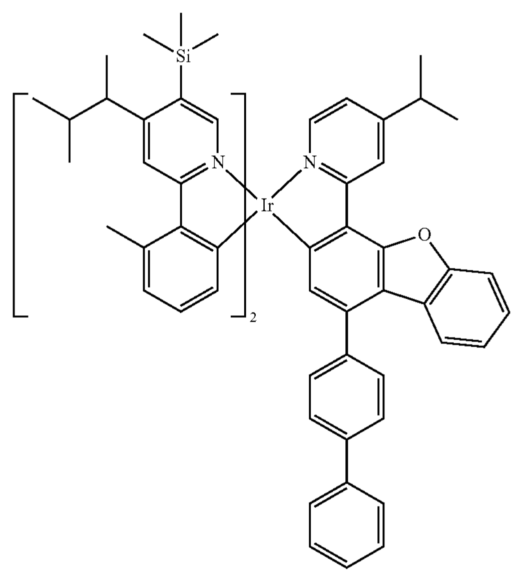
1564
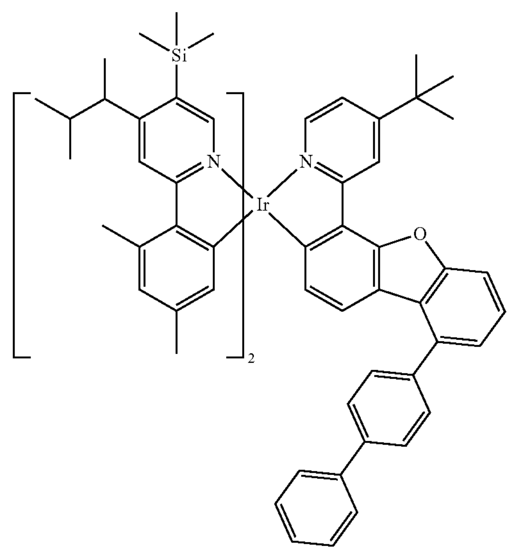

-continued
1565
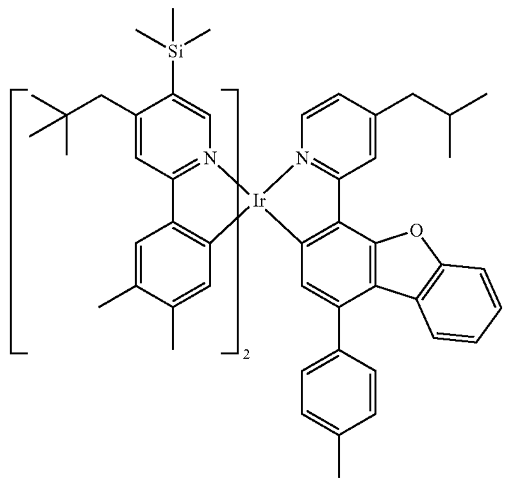
1566
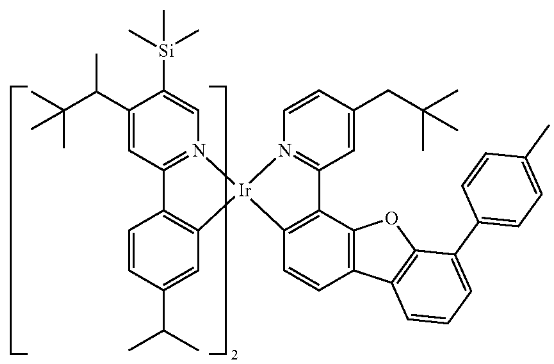
1567
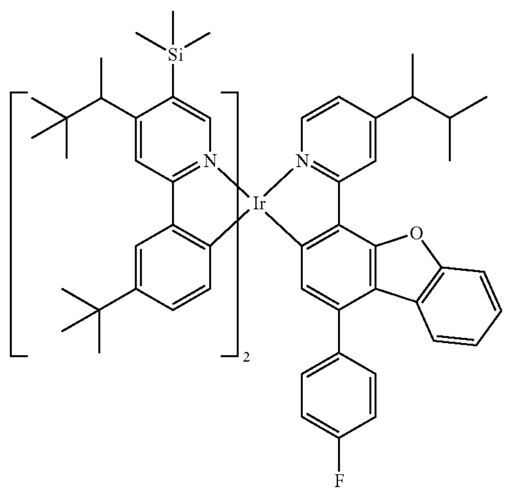
-continued
1568
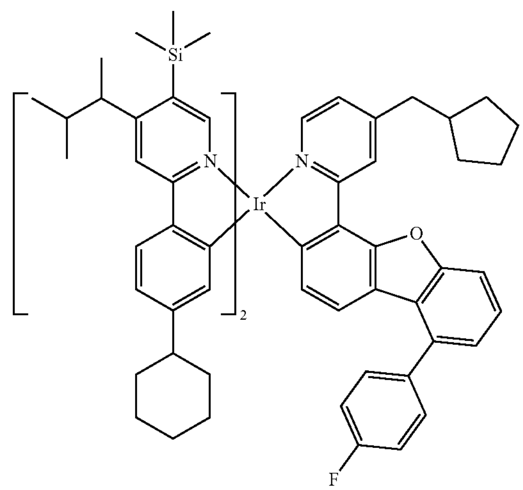
1569
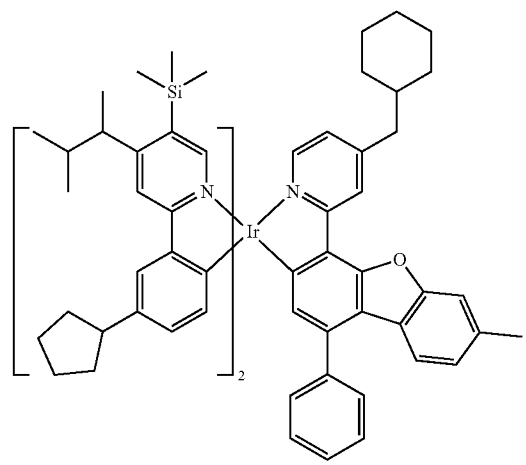
1570
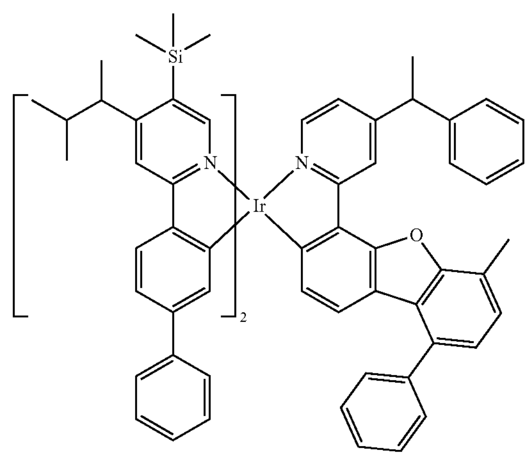

-continued
1571
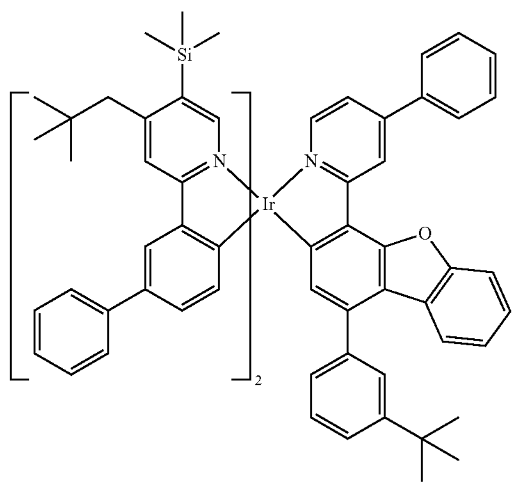
1572
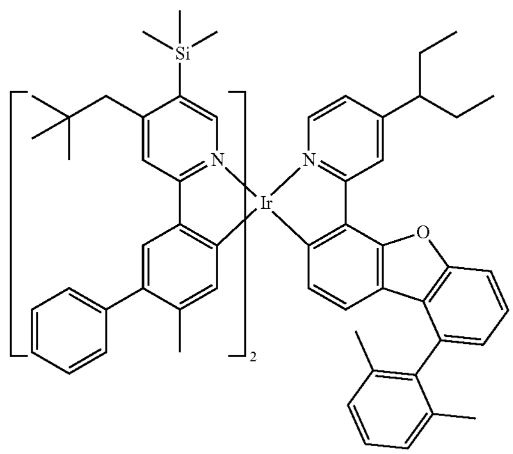
1573
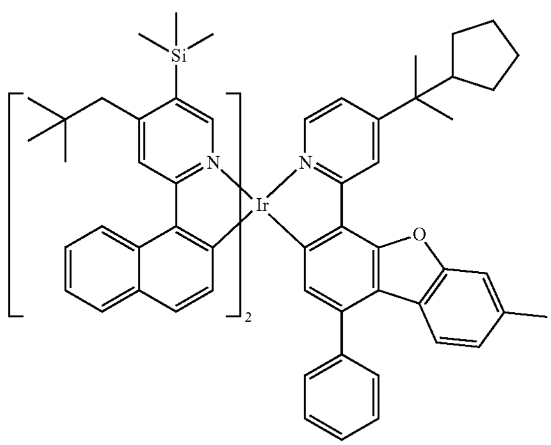
-continued
1574
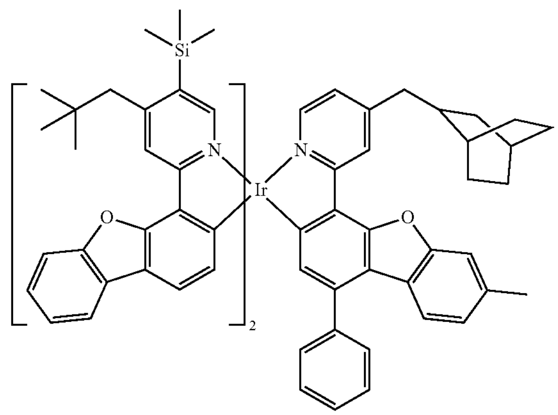
1575
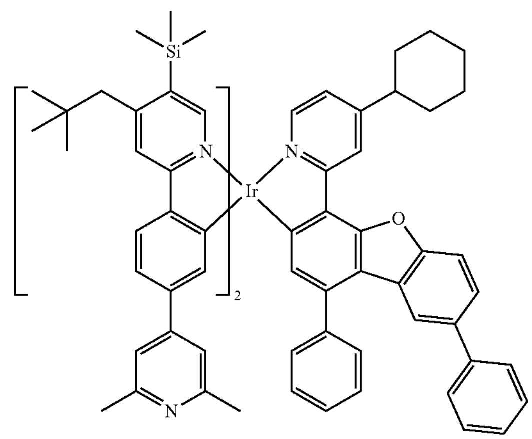
1576
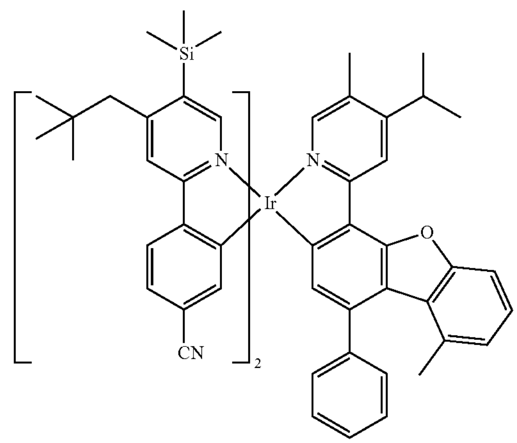

-continued
1577
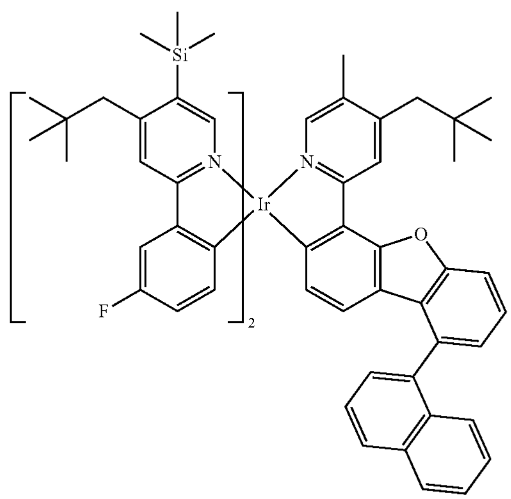
1578
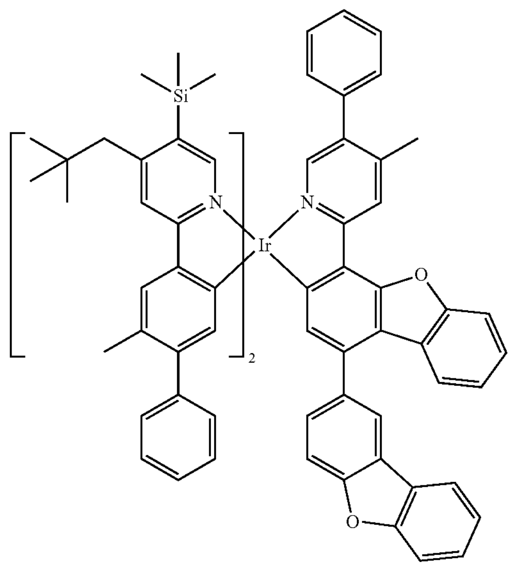
1579
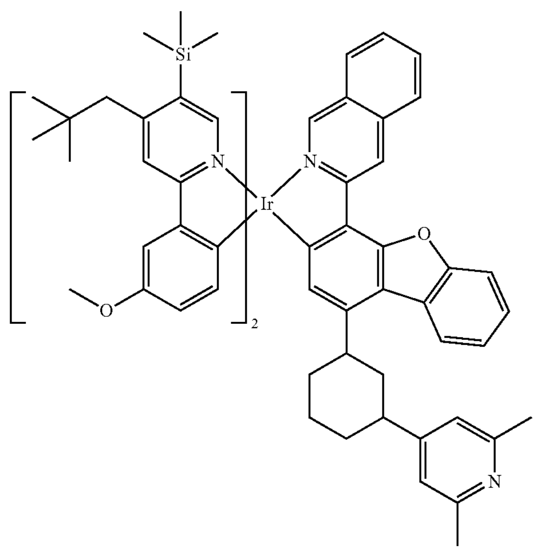
-continued
1580
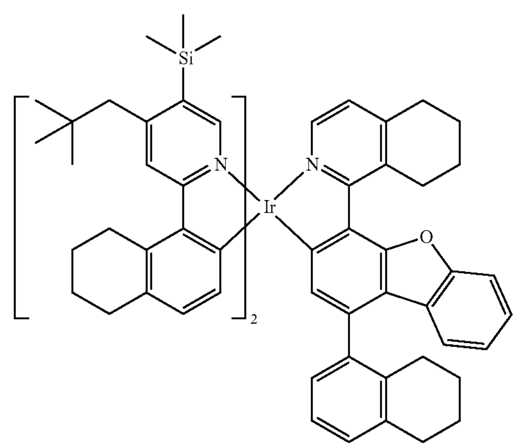
1581
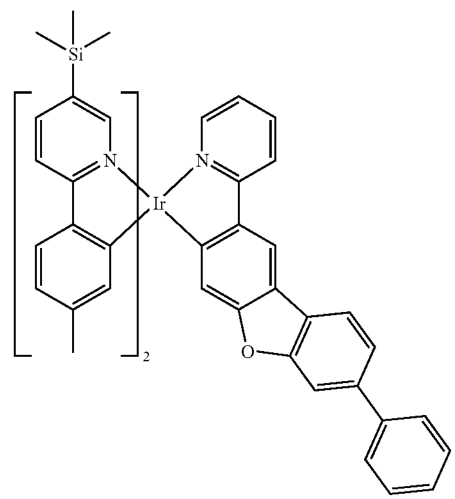
1582
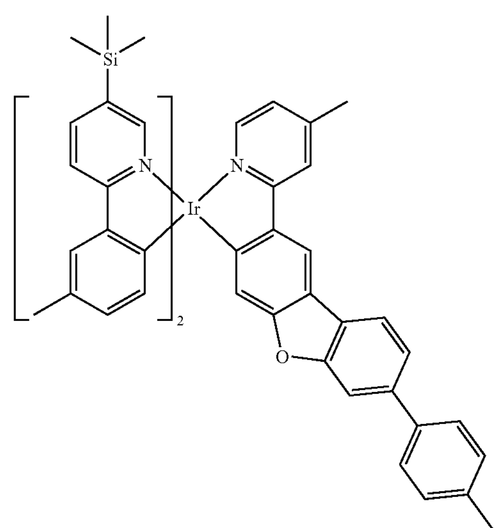

-continued
1583
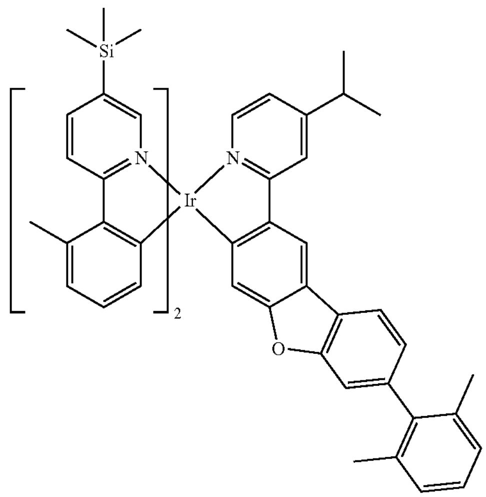
1584
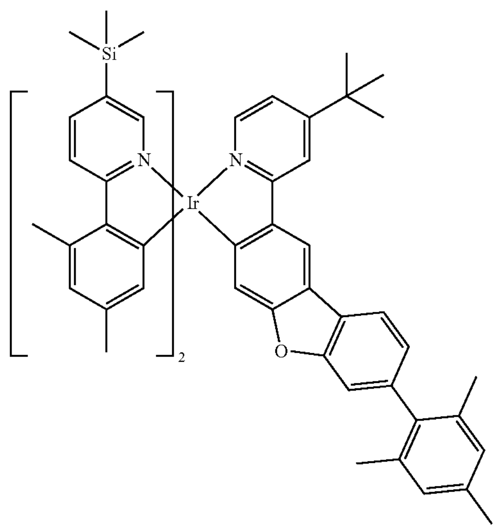
1585
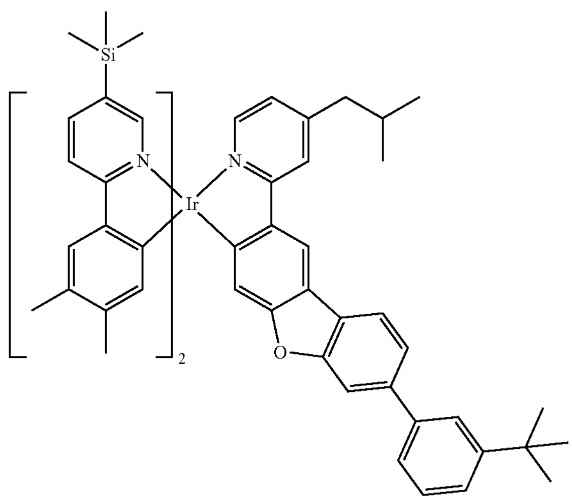
-continued
1586
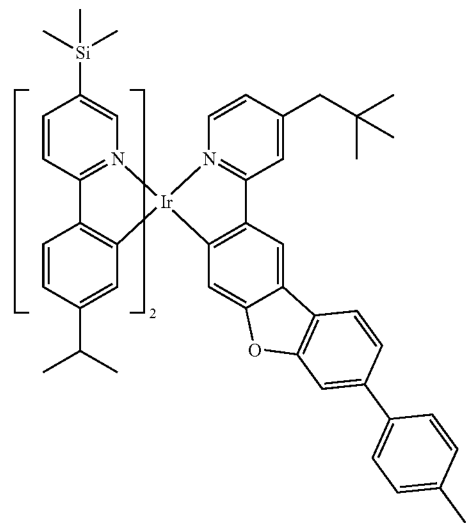
1587
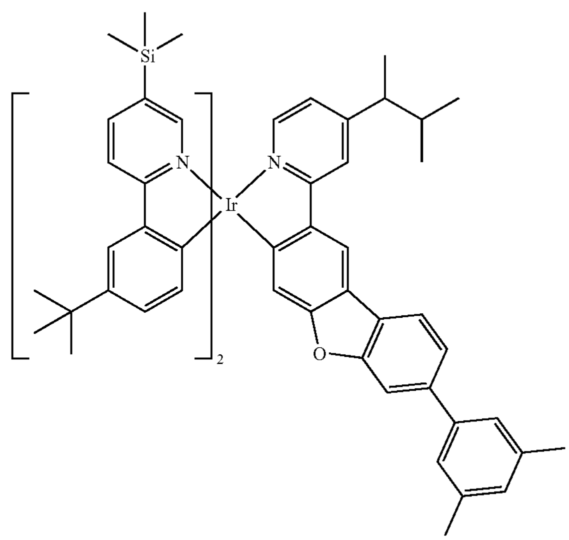
1588
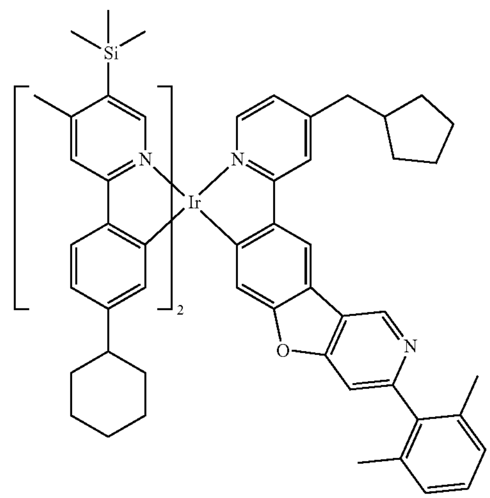

-continued
1589
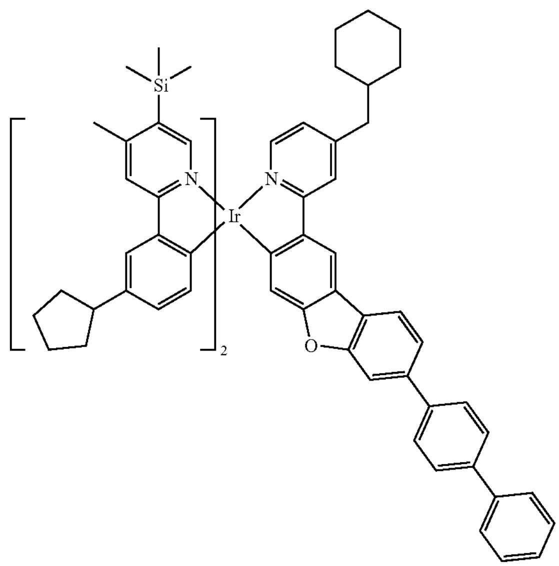
1590
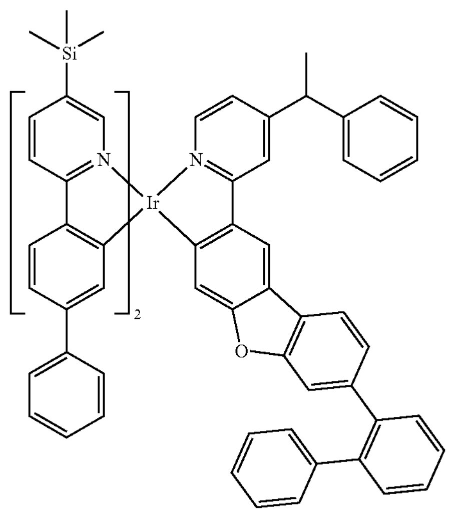
1591
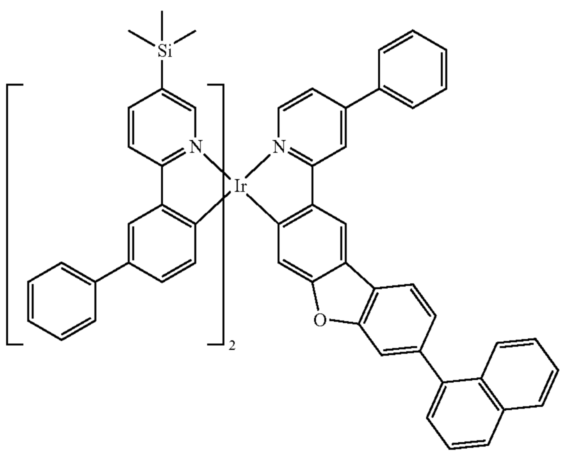
-continued
1592
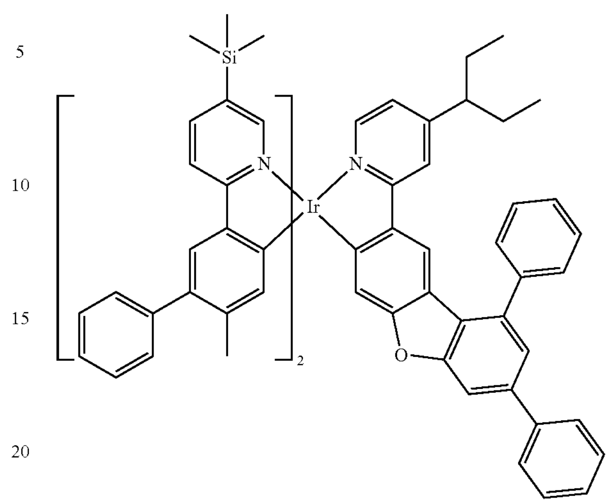
1593
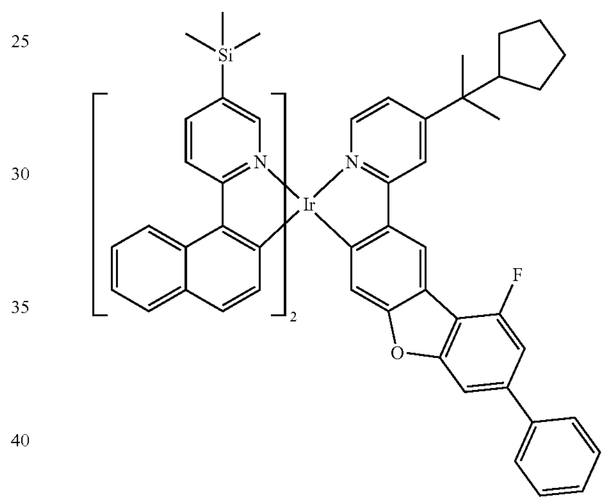
1594
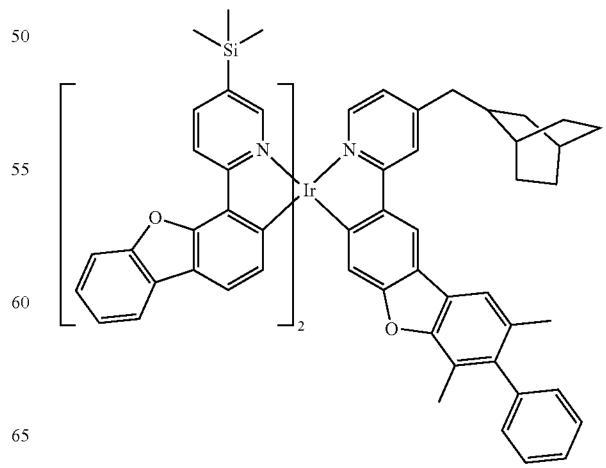

-continued
1595
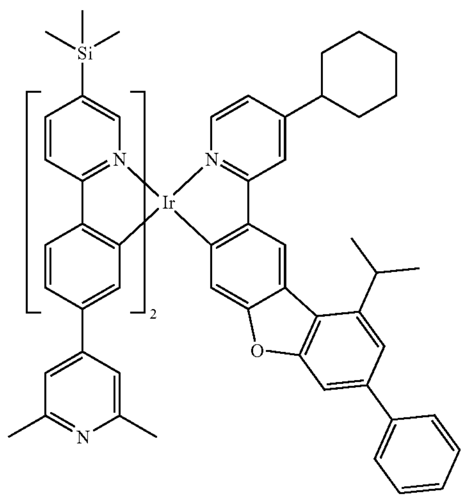
1596
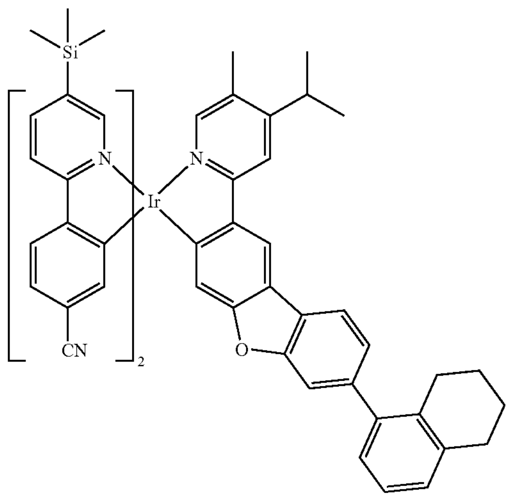
1597
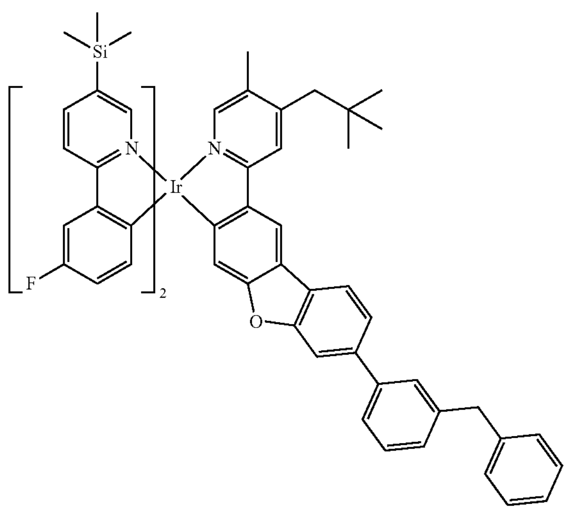
-continued
1598
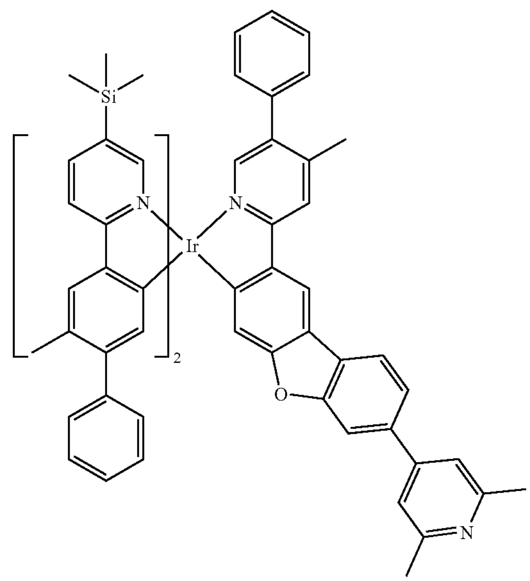
1599
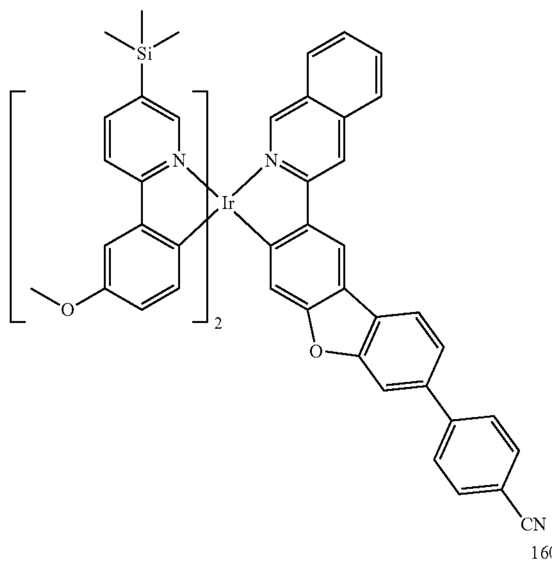
1600
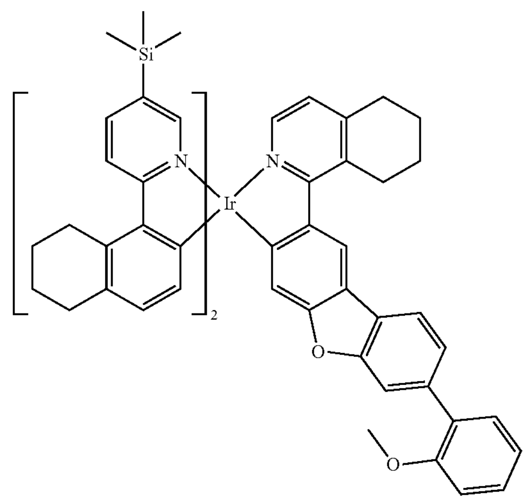

-continued
1601
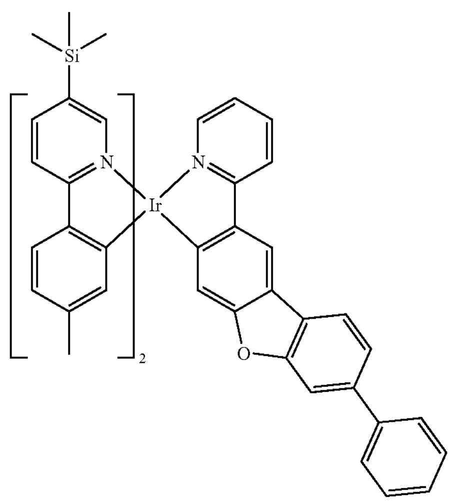
1602
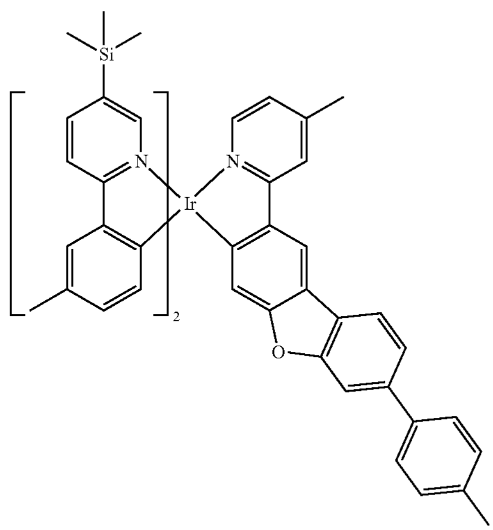
1603
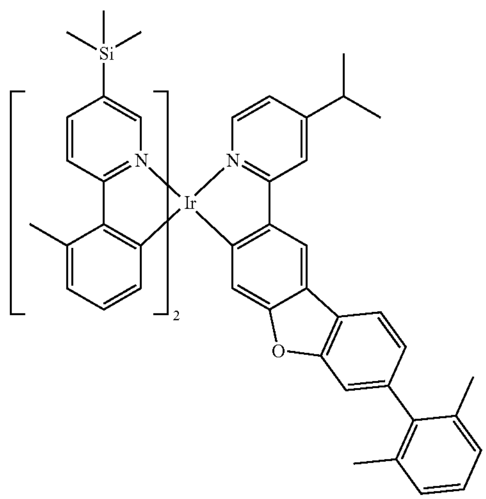
-continued
1604
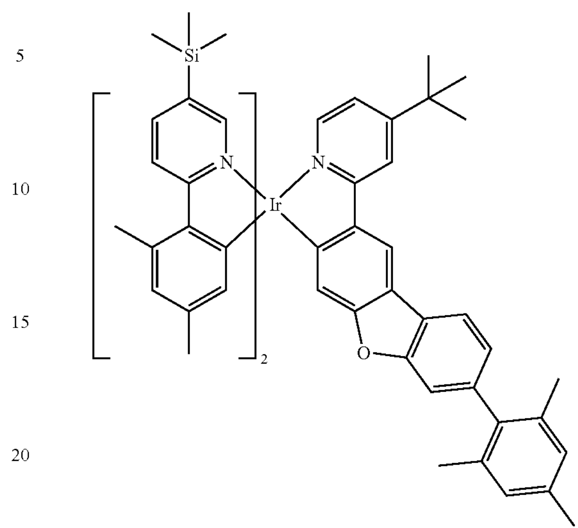
1605
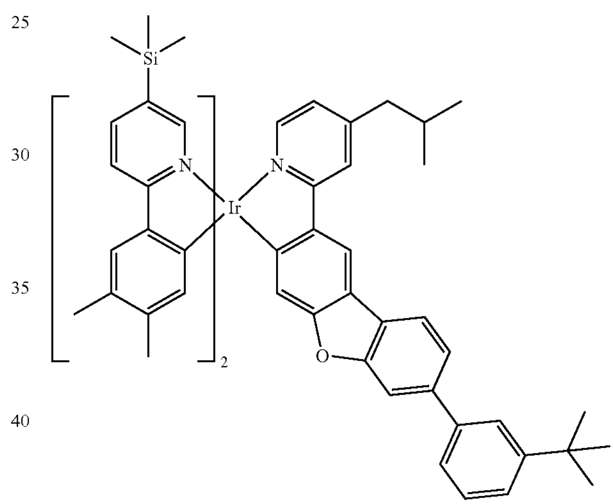
1606
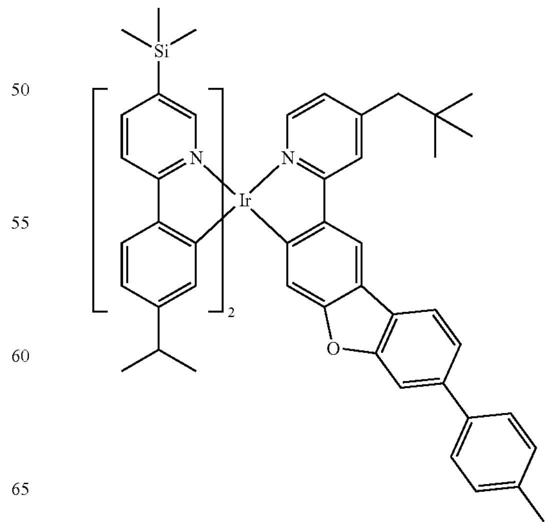

-continued
1607
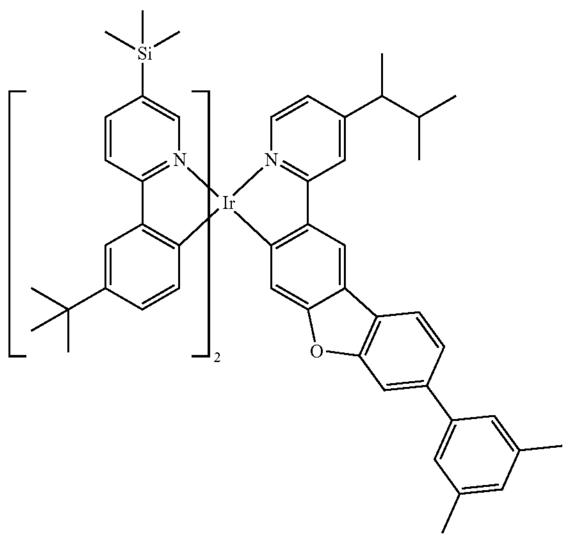
1608
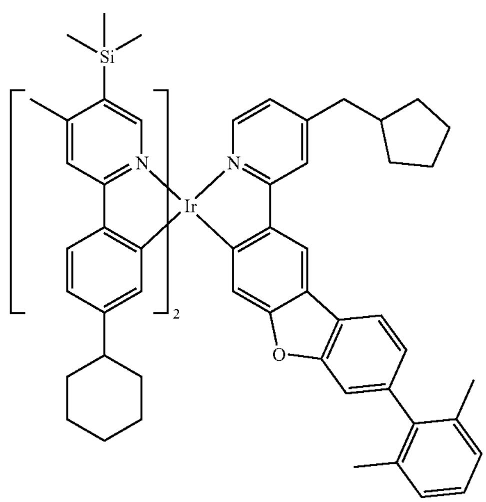
1609
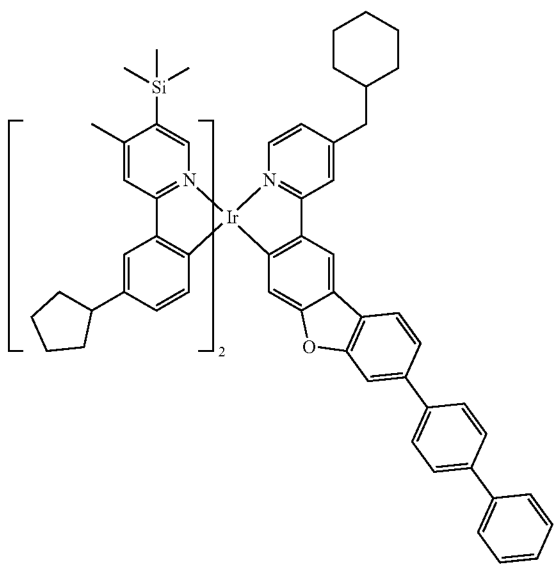
-continued
1610
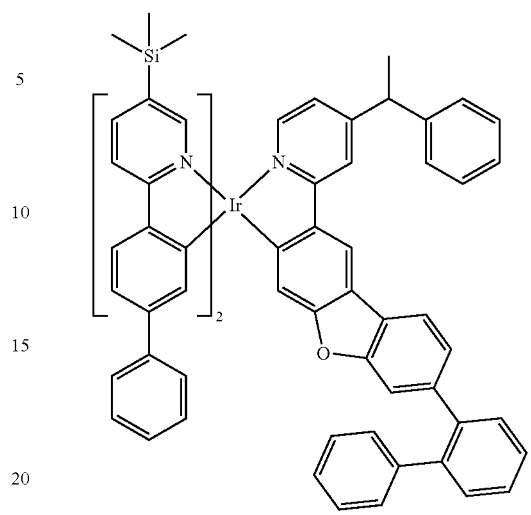
1611
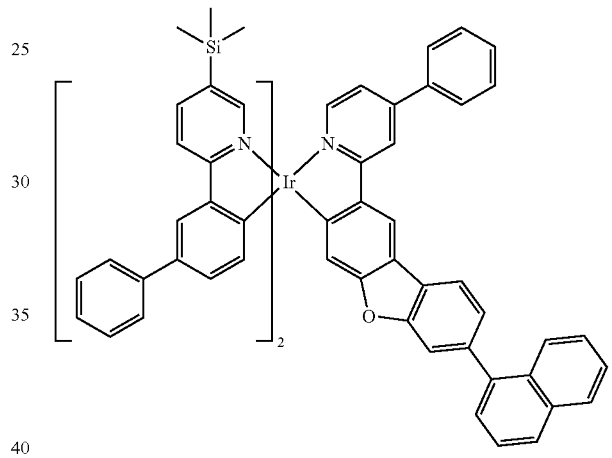
1612
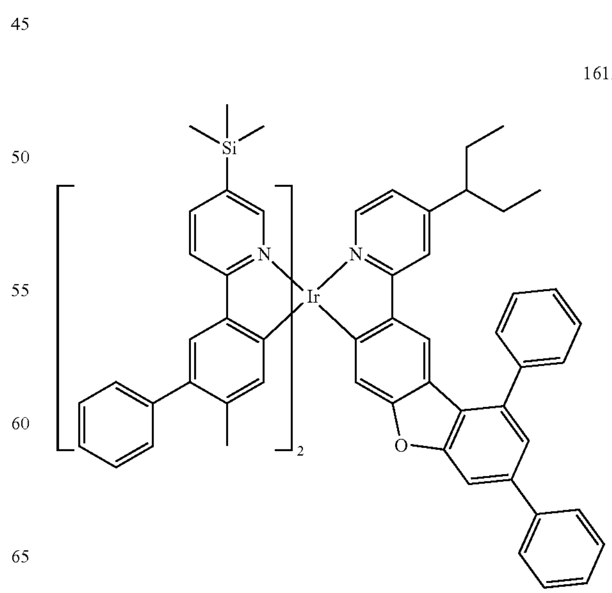

-continued
1613
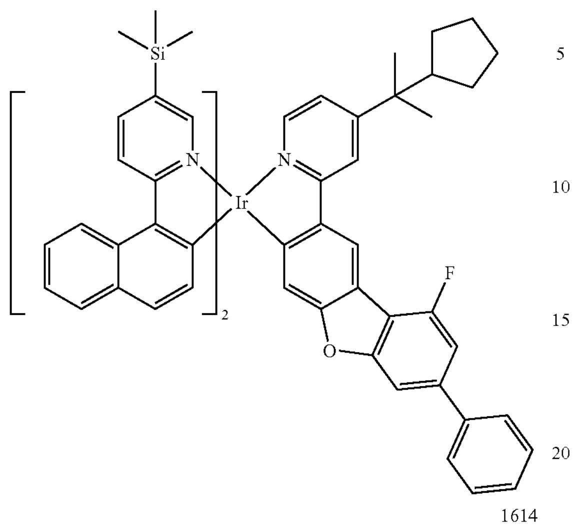
1614
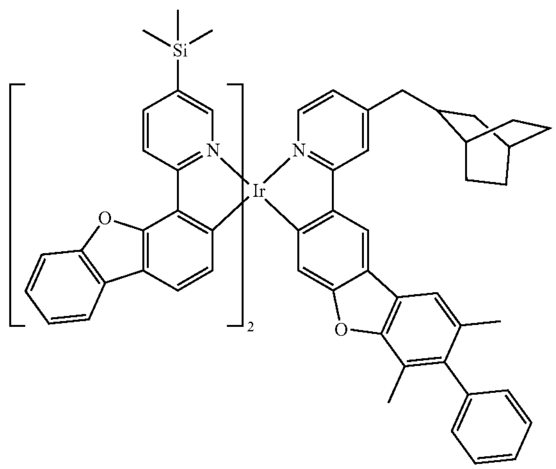
1615
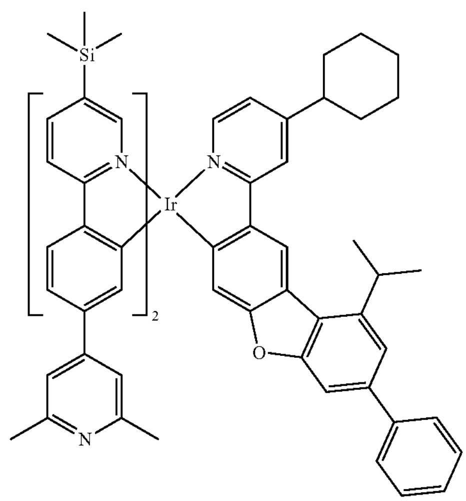
-continued
1616
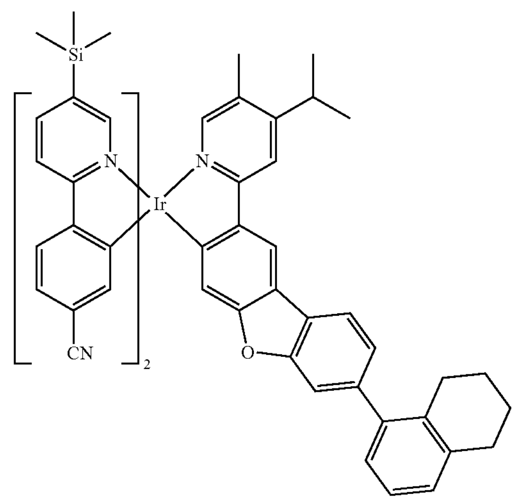
1617
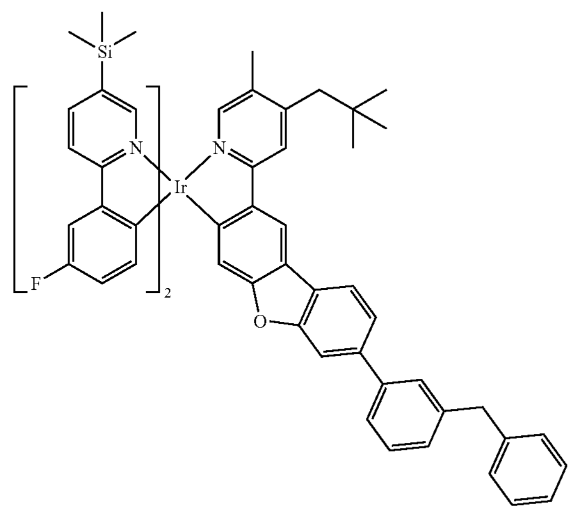
1618
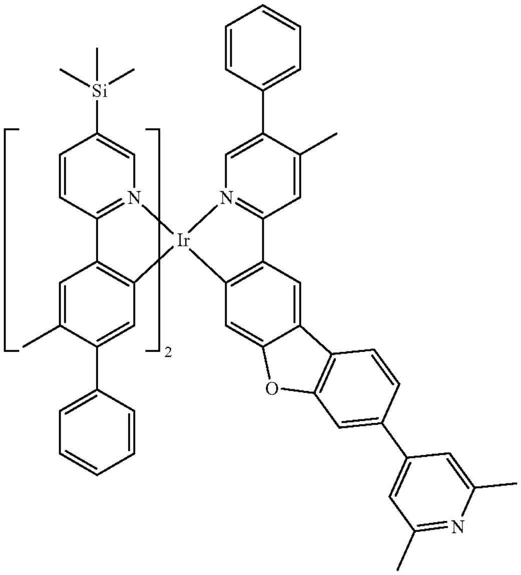

-continued
1619
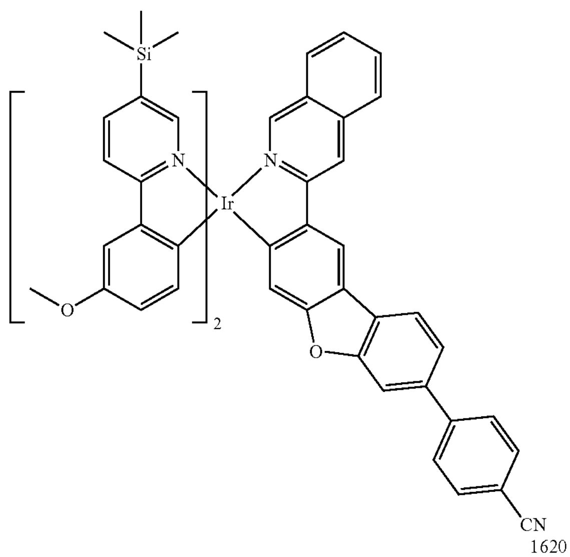
1620
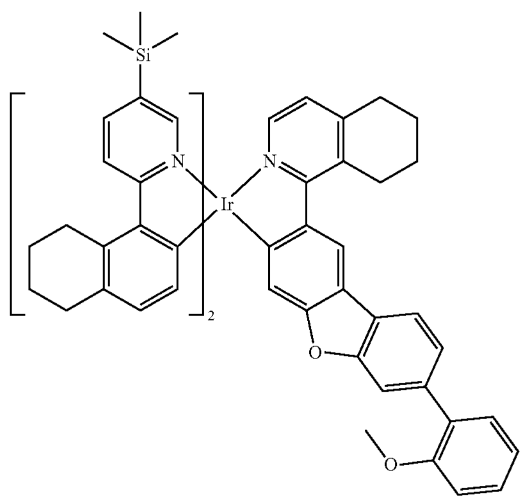
1621
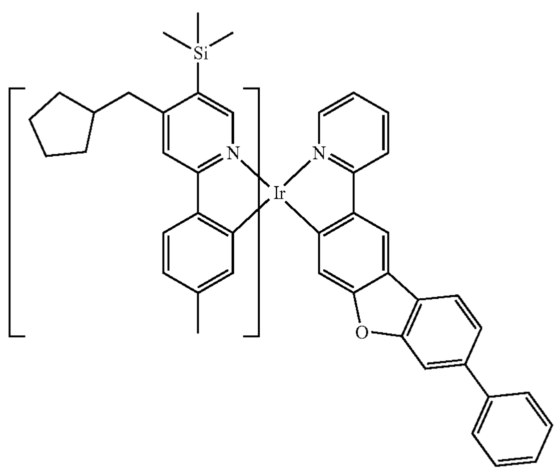
-continued
1622
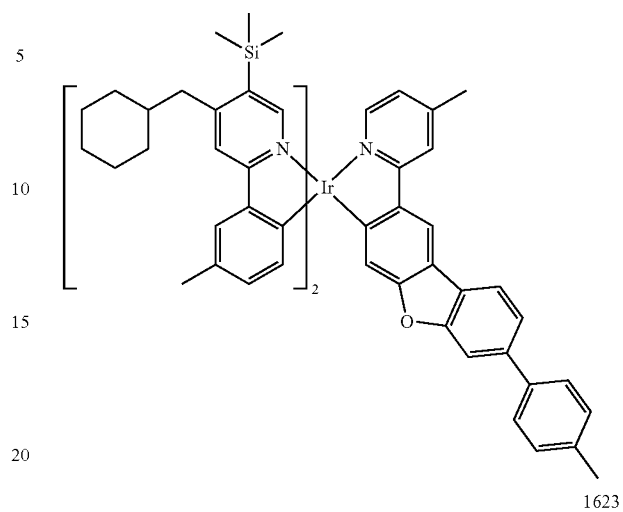
1623
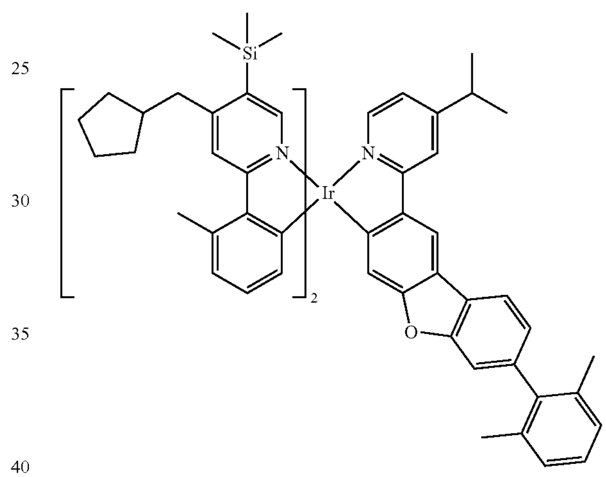
1624
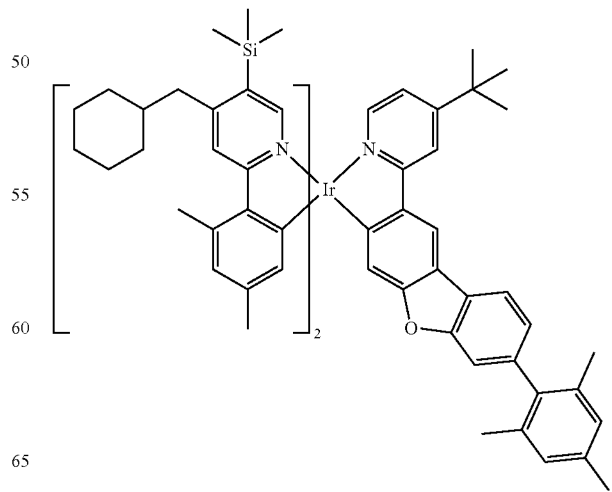

-continued
1625
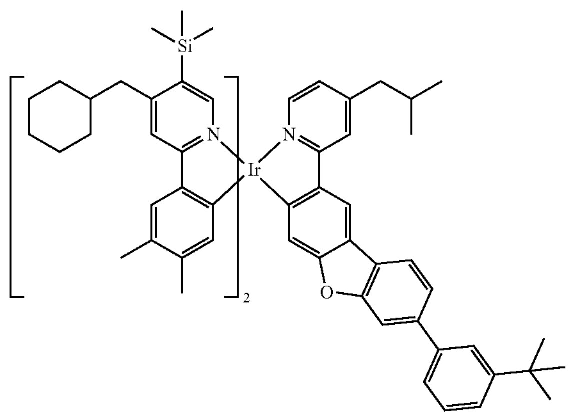
1626
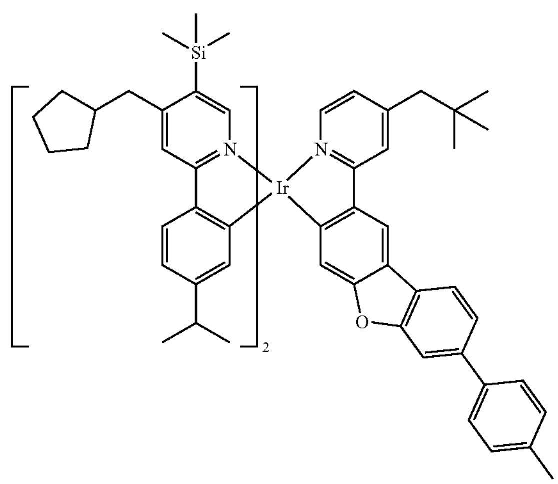
1627
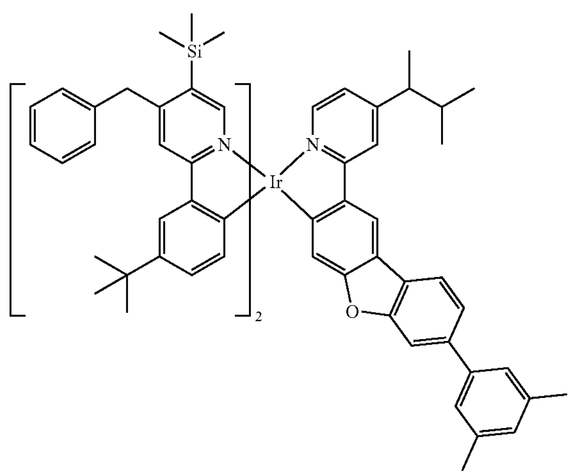
-continued
1628
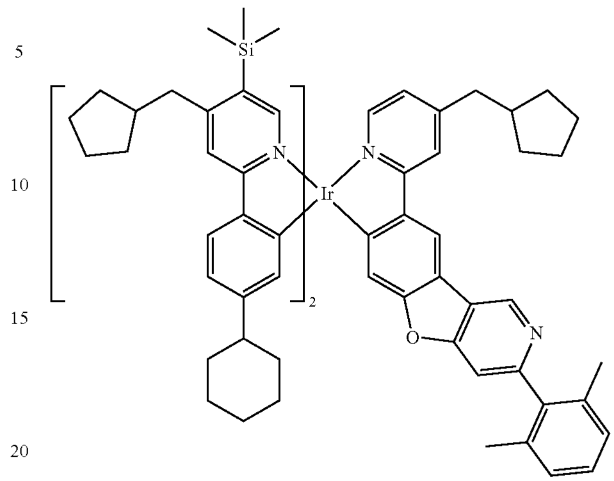
1629
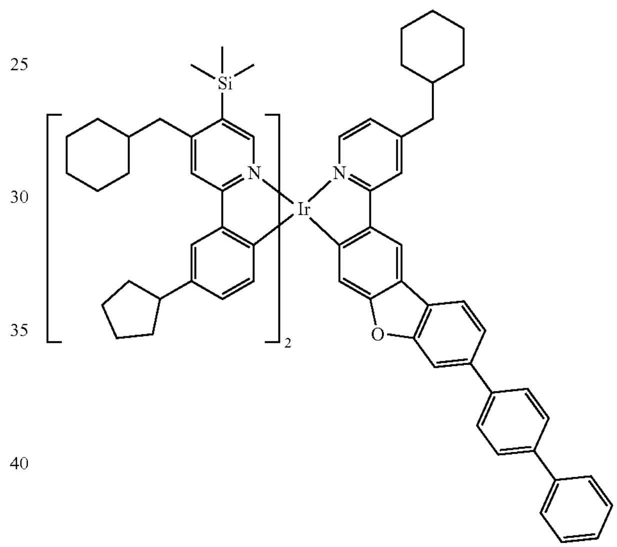
1630
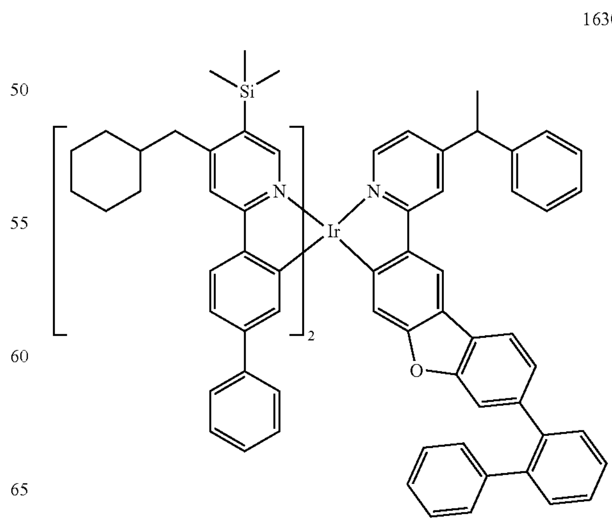

-continued
1631
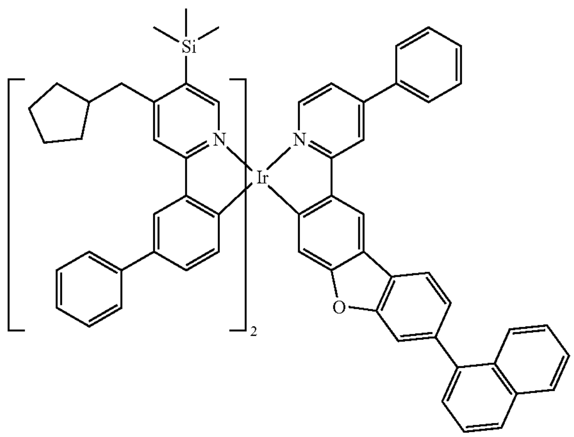
1632
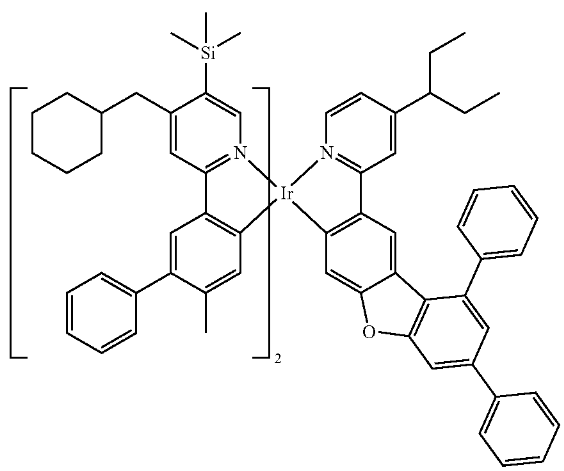
1633
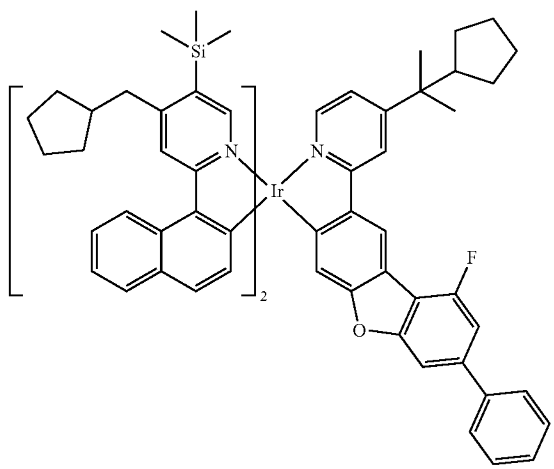
-continued
1634
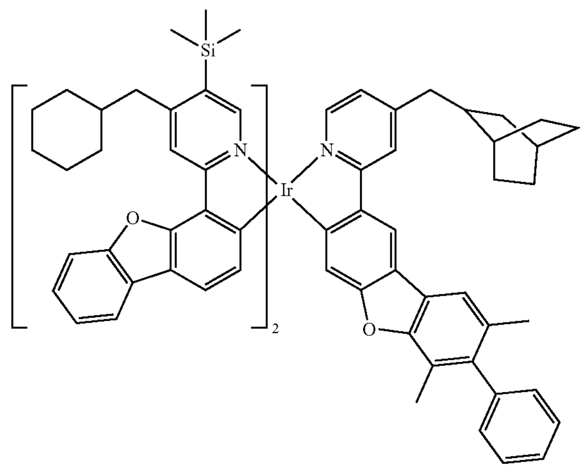
1635
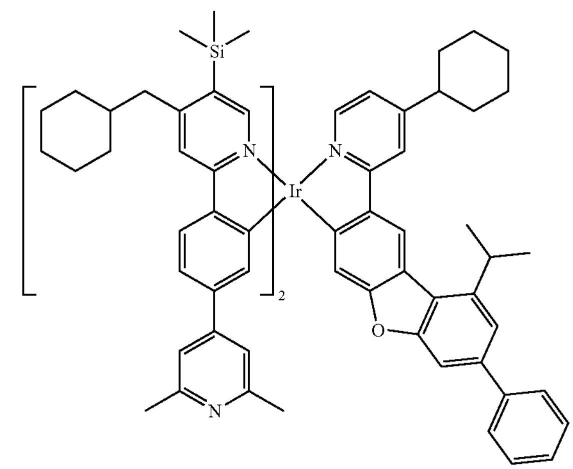
1636
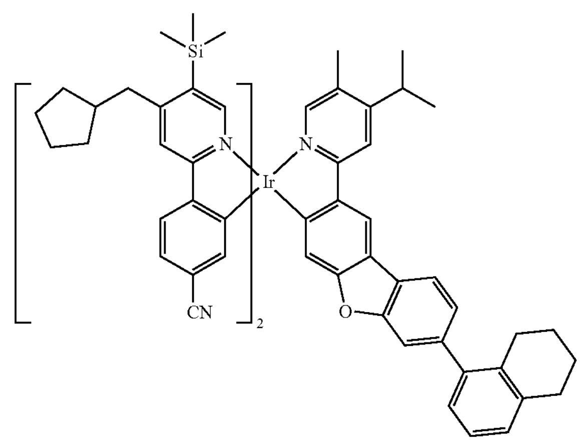

-continued
1637
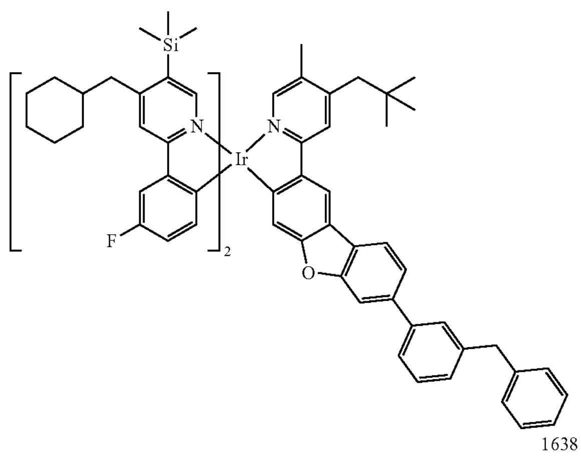
1638
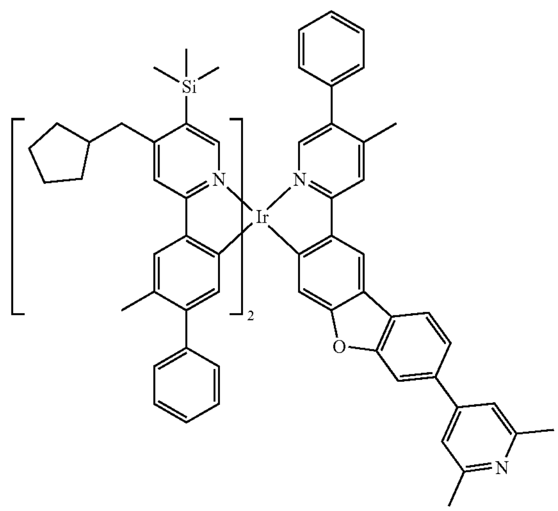
1639
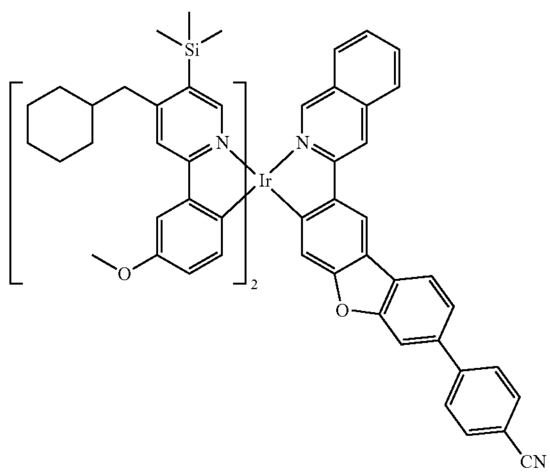
-continued
1640
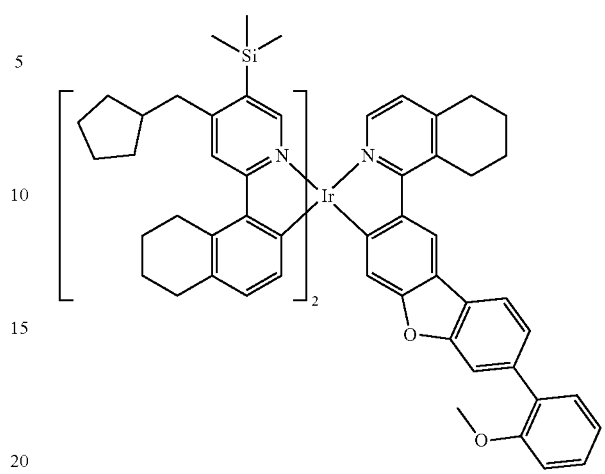
1641
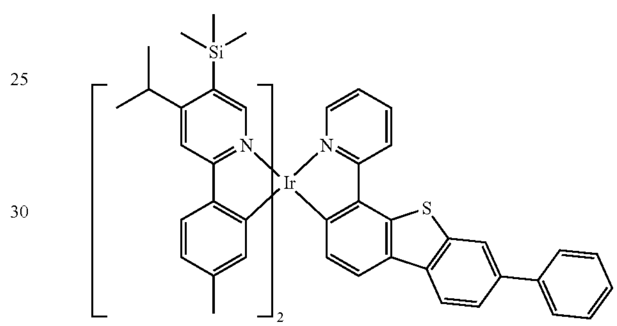
1642
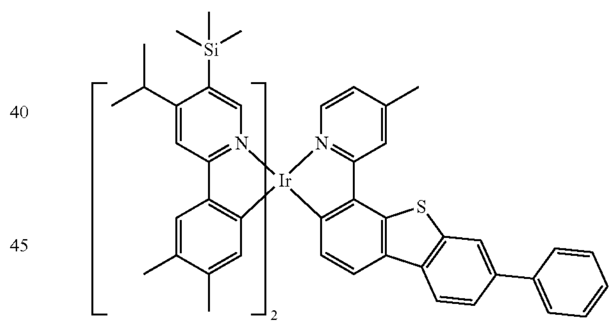
1643
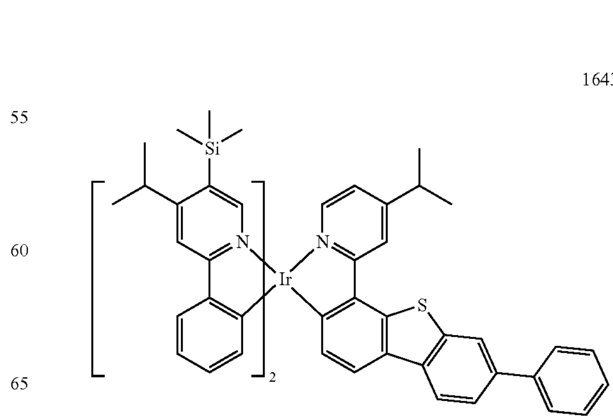

-continued
1644
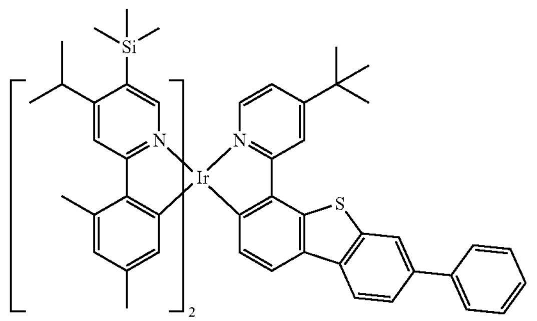
1645
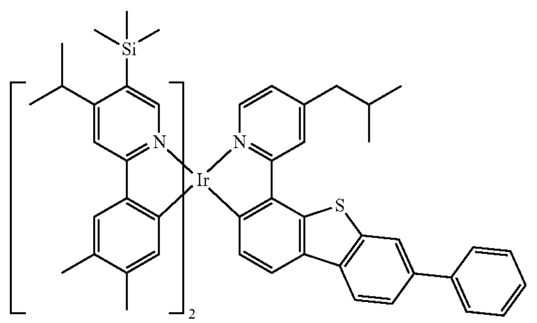
1646
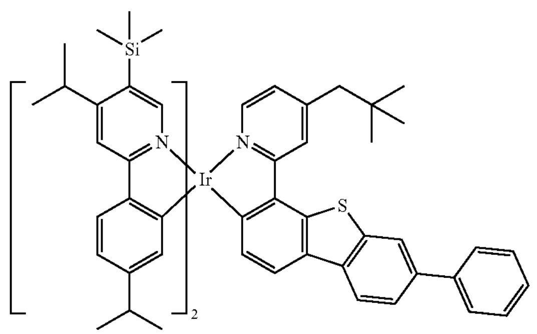
1647
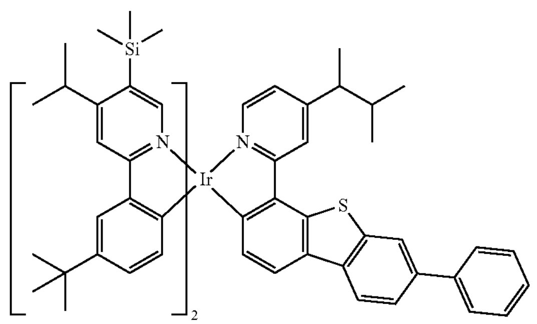
-continued
1648
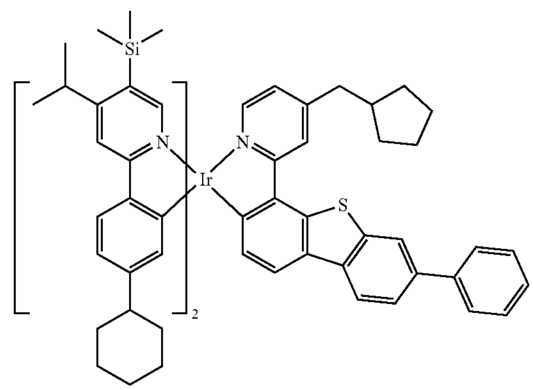
1649
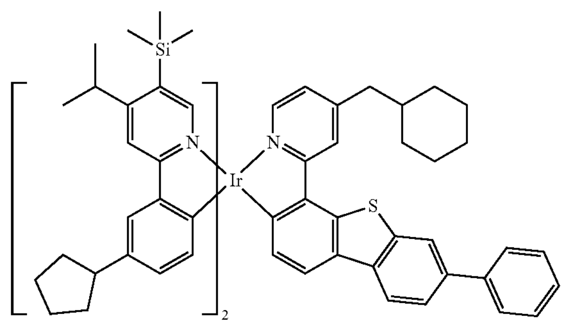
1650
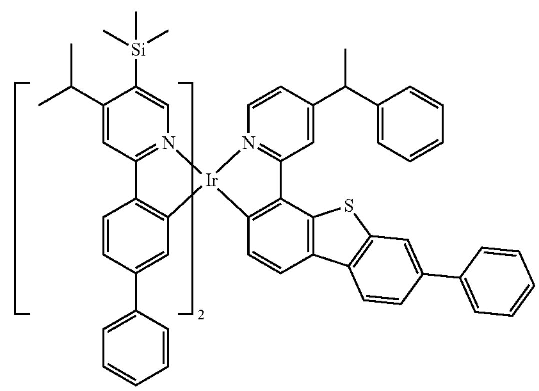
1651
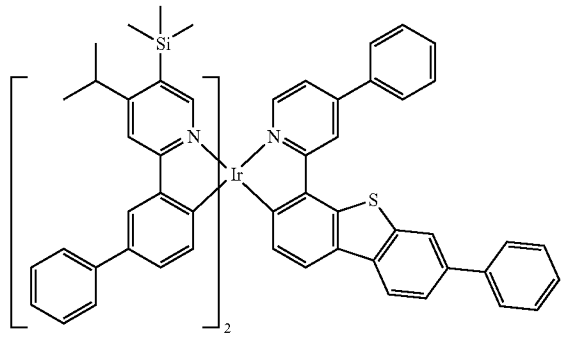

1652
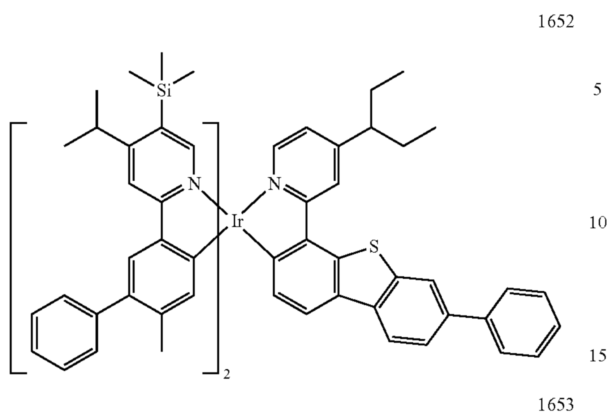
1653
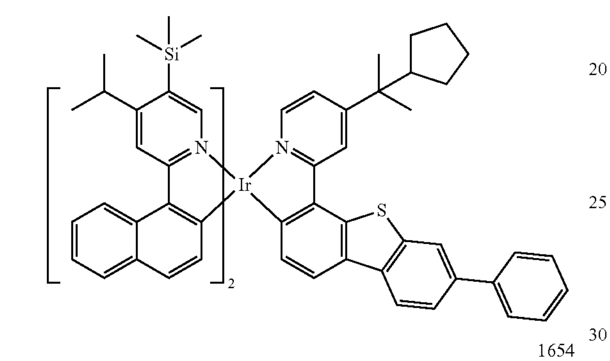
1654
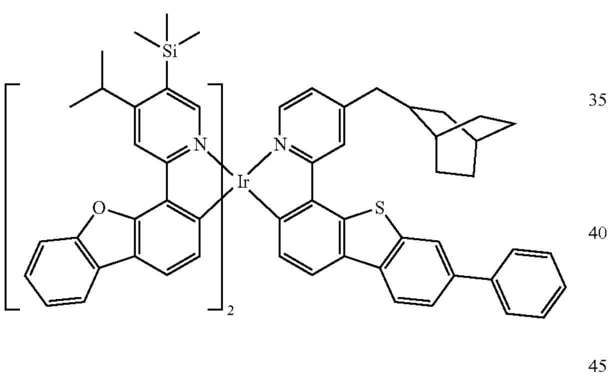
1655
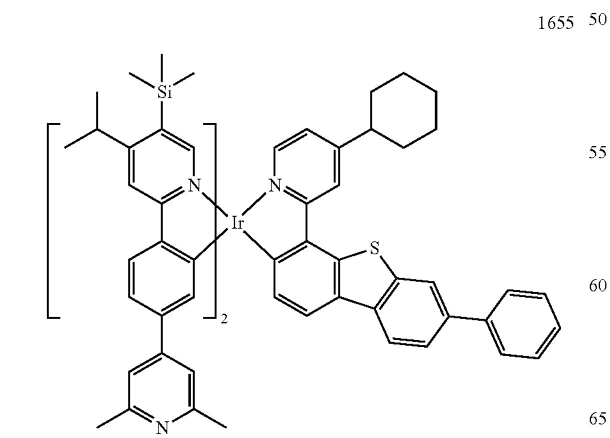
1656
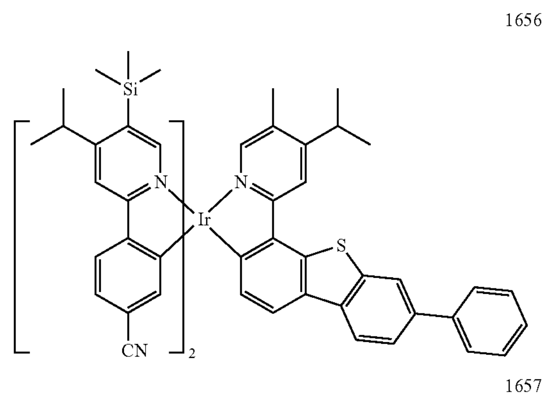
1657
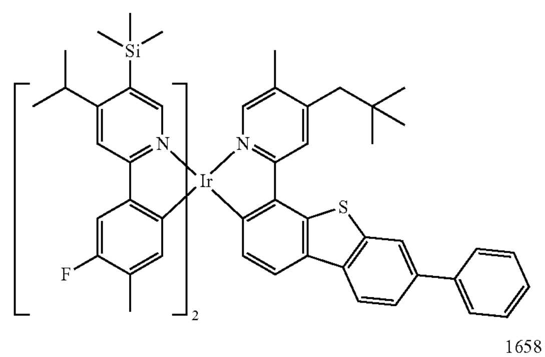
1658
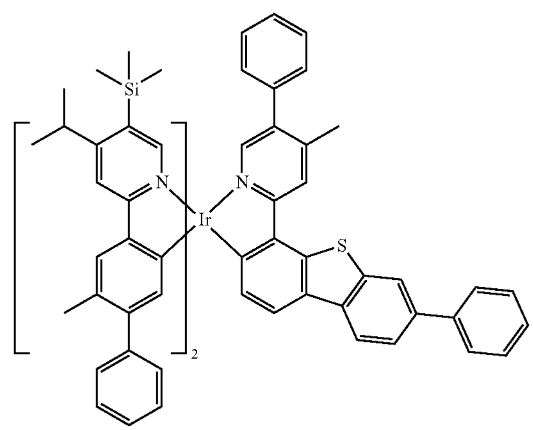
1659
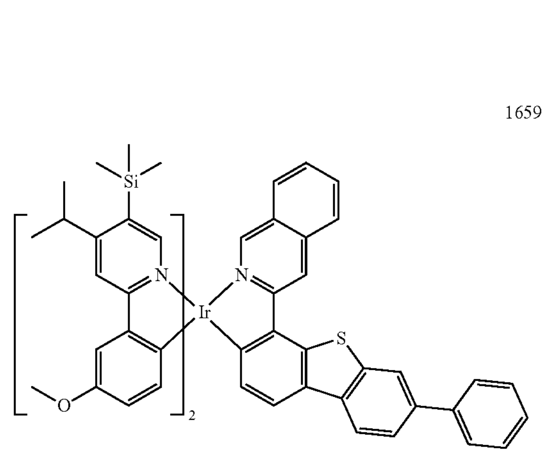

-continued
1660
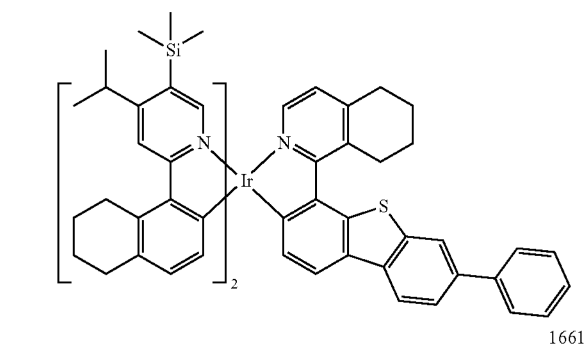
1661
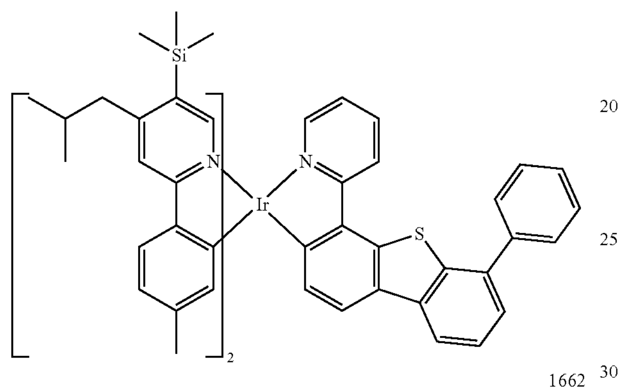
1662
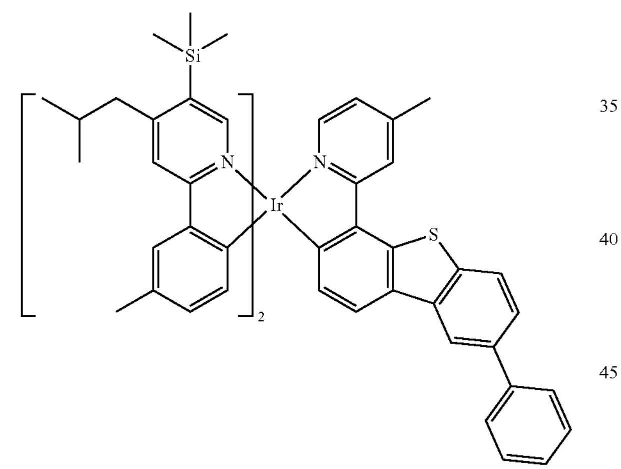
1663
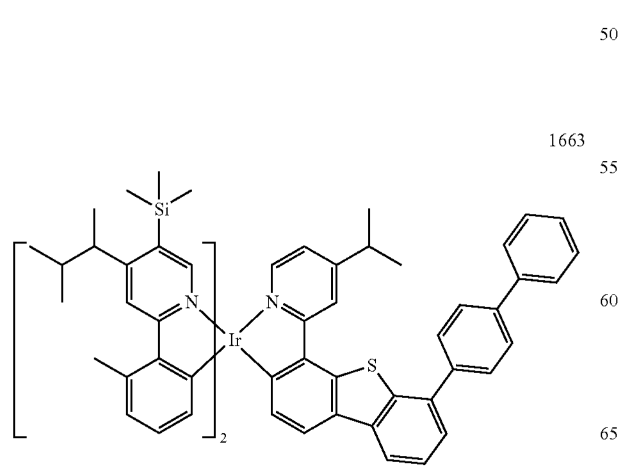
-continued
1664
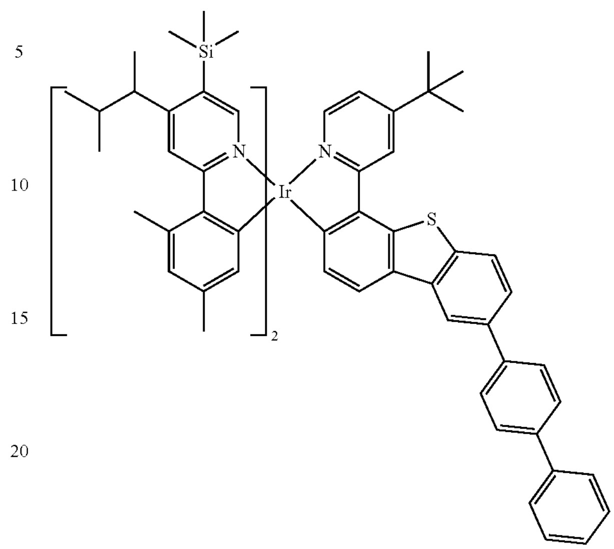
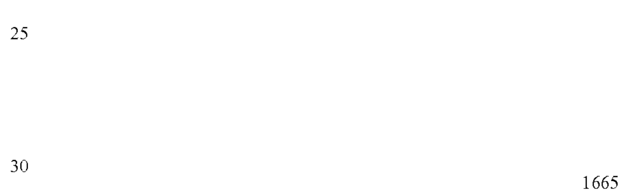
1665
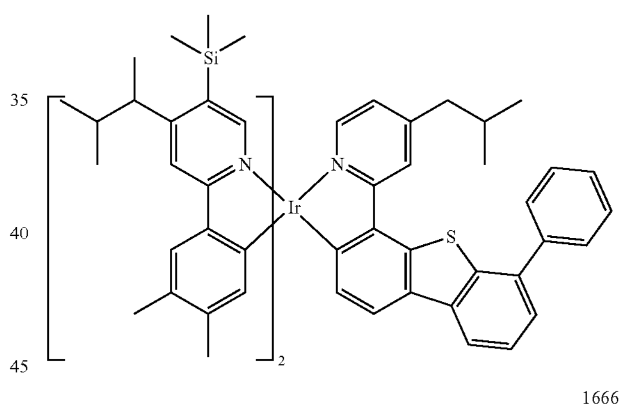
1666
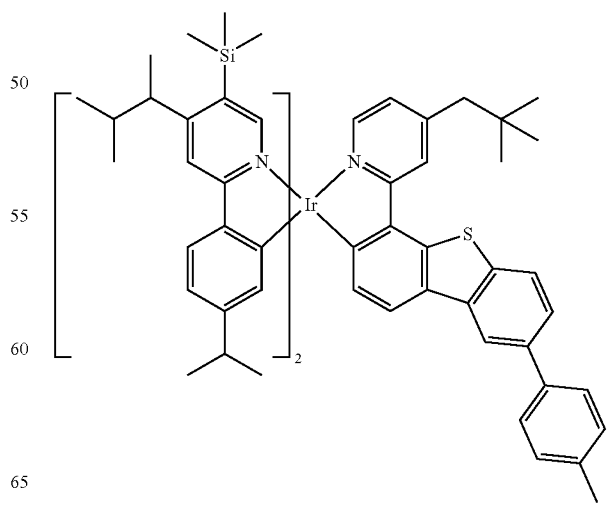

-continued
1667
1507
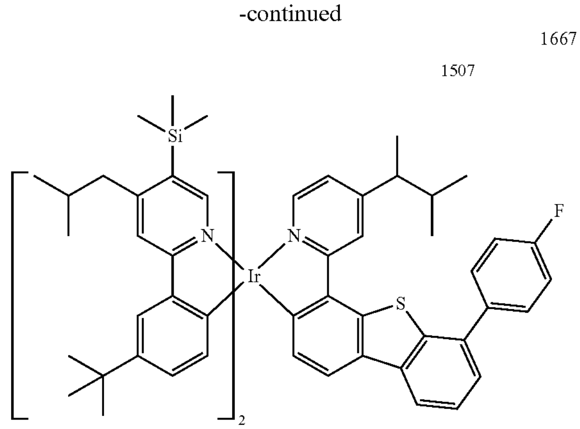
1668
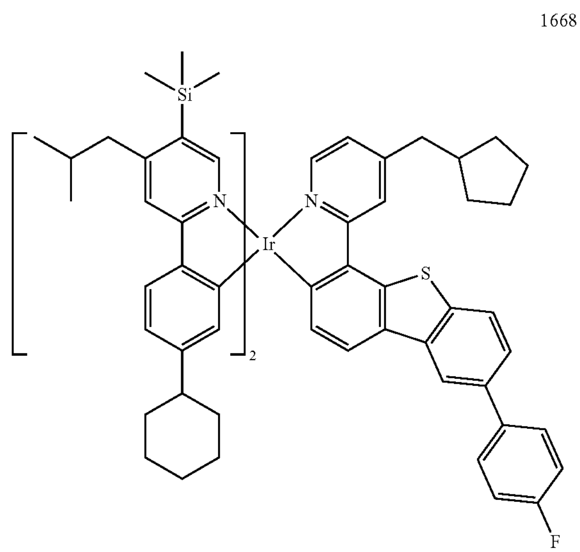
1669
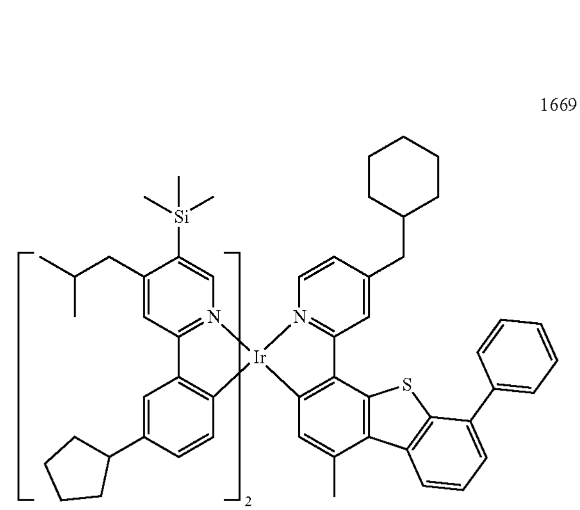
-continued
1670
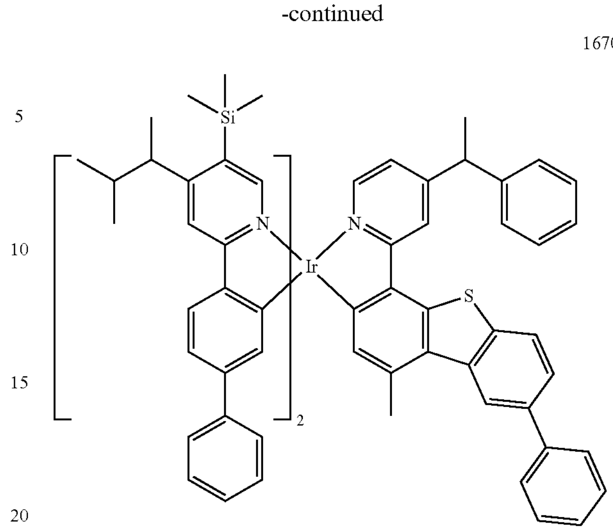
1671
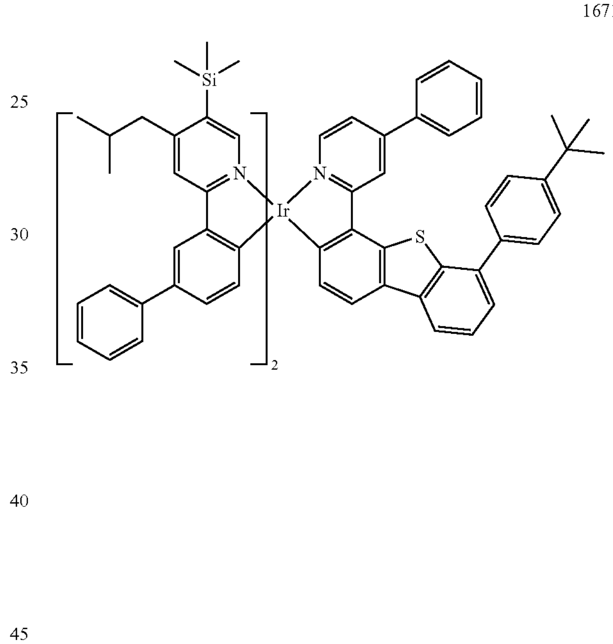
1672
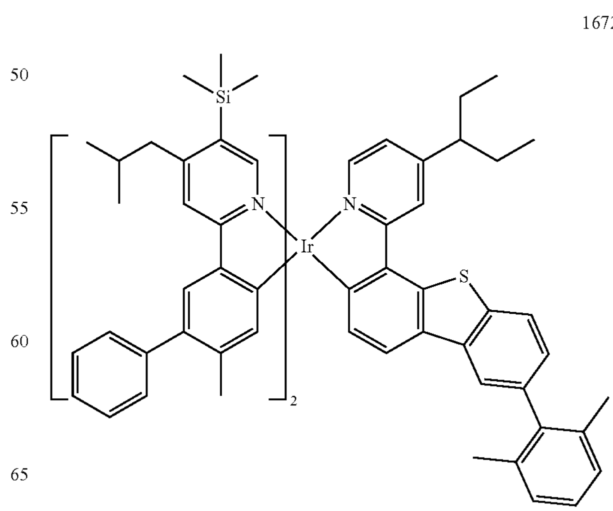

-continued
1673
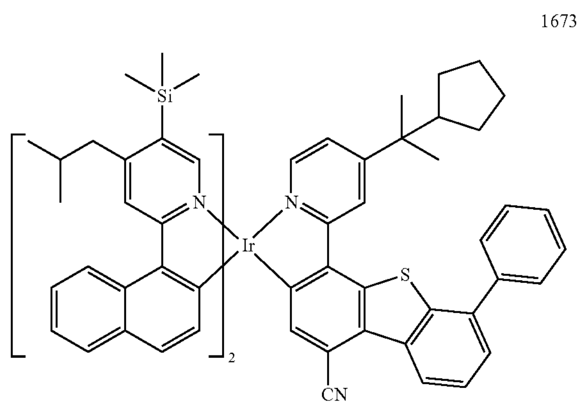
1674
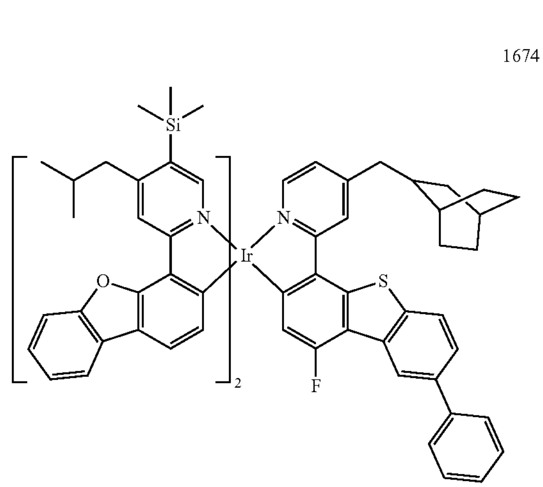
1675
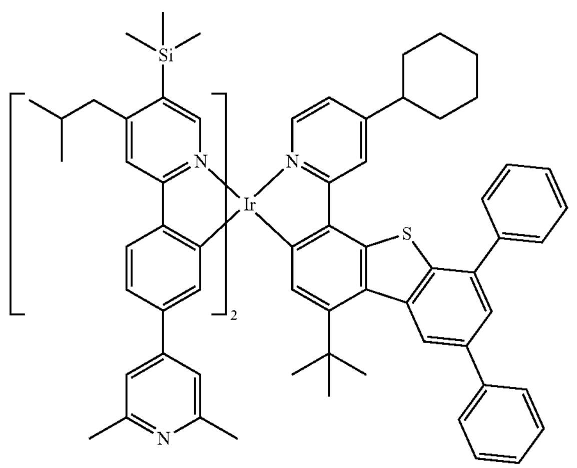
-continued
1676
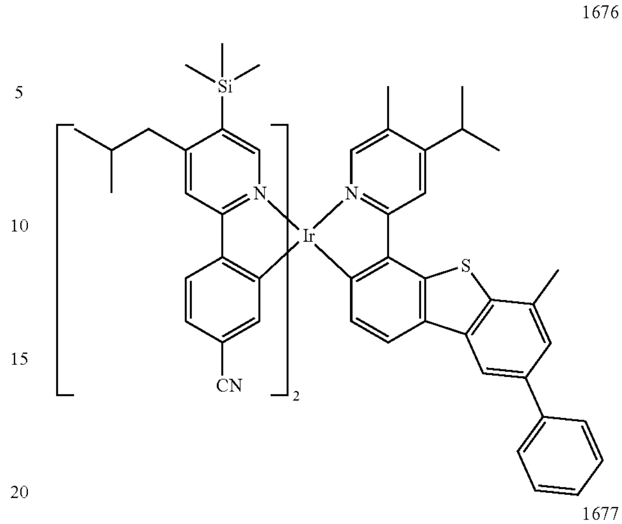
1677
1678
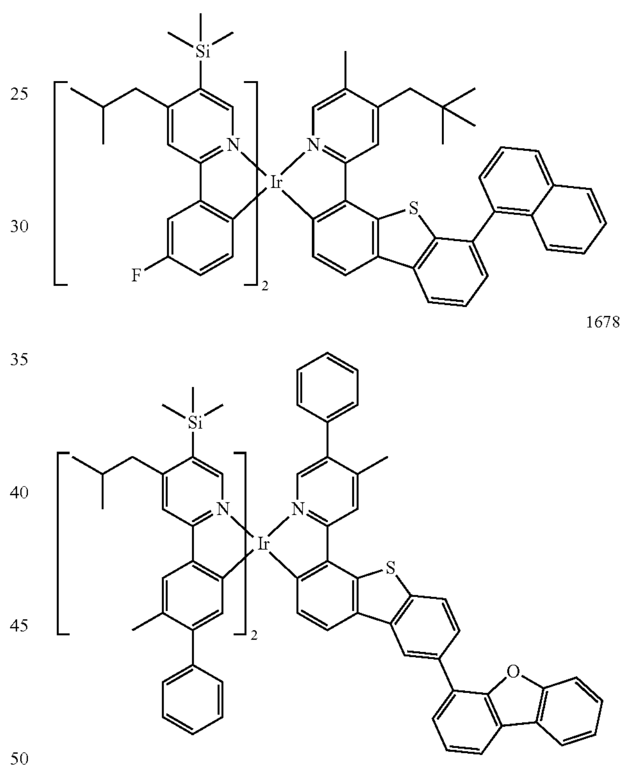
1679
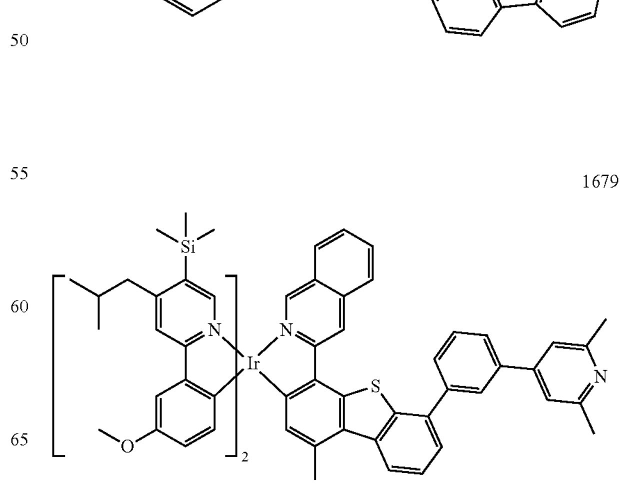

-continued
1680
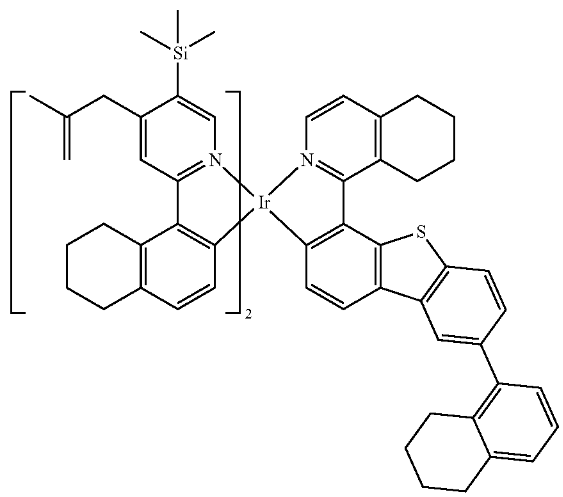
1681
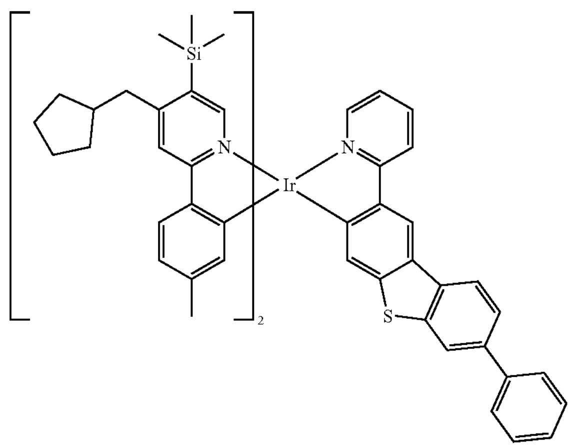
1682
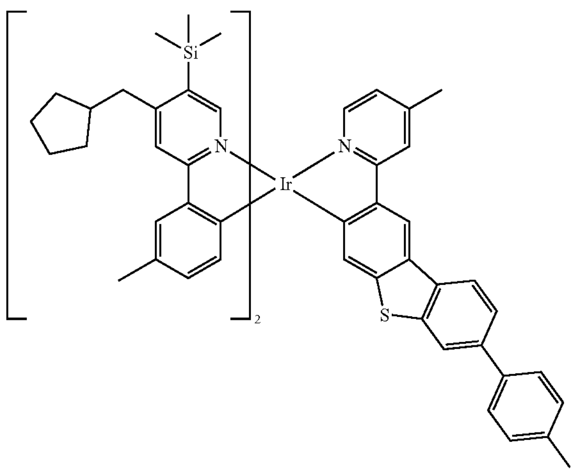
-continued
1683
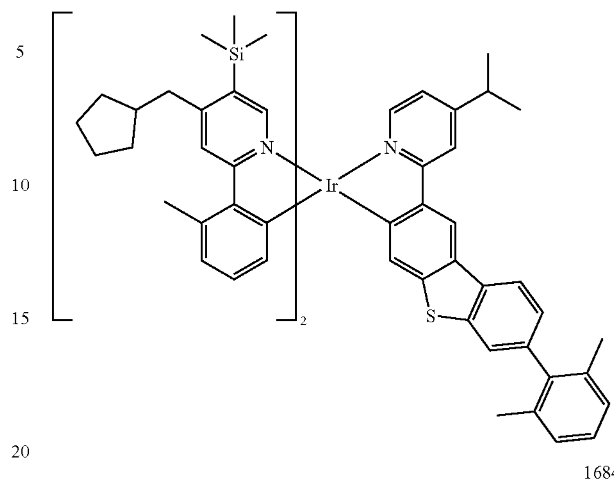
1684
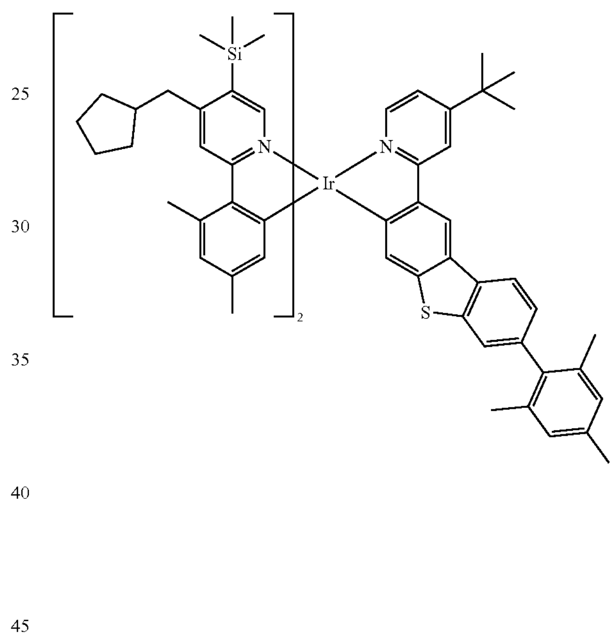
1685
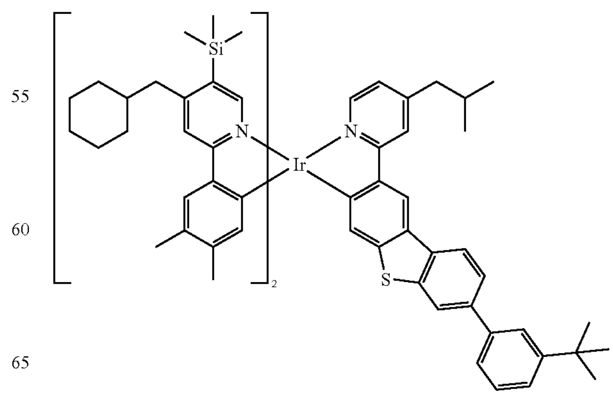

-continued
1686
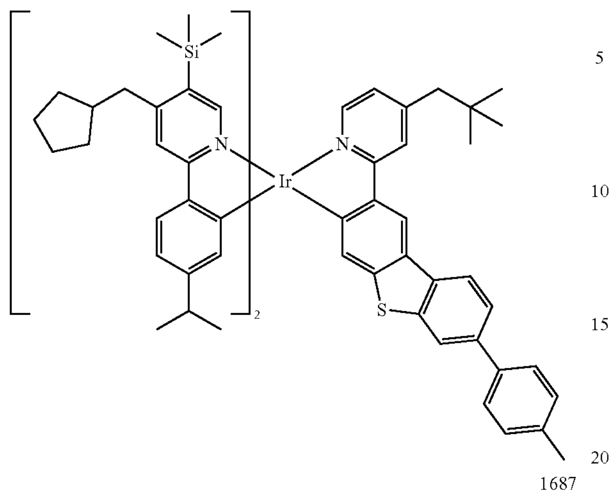
1687
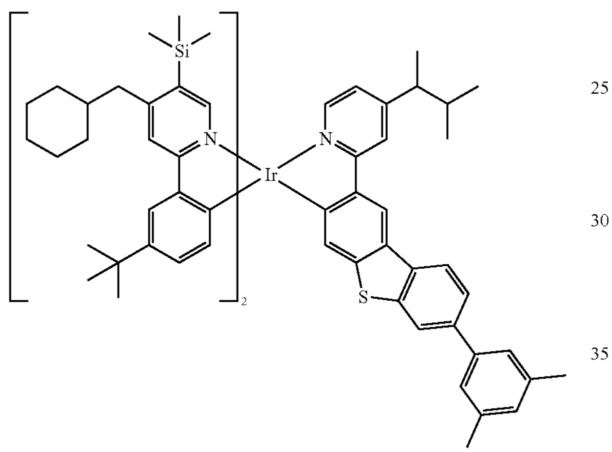
1688
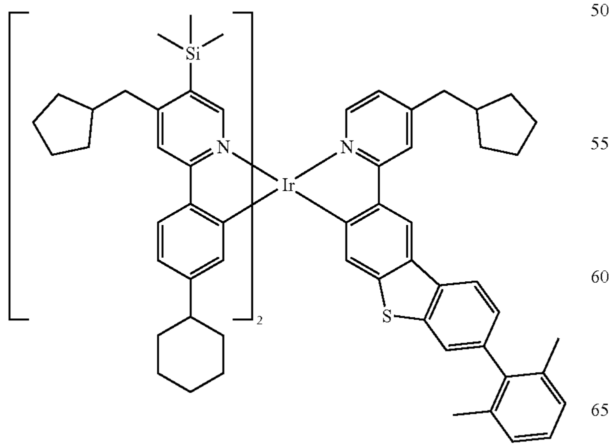
-continued
1689
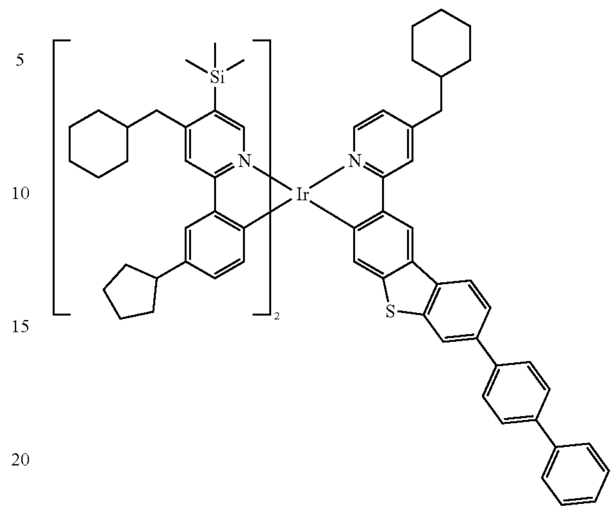
1690
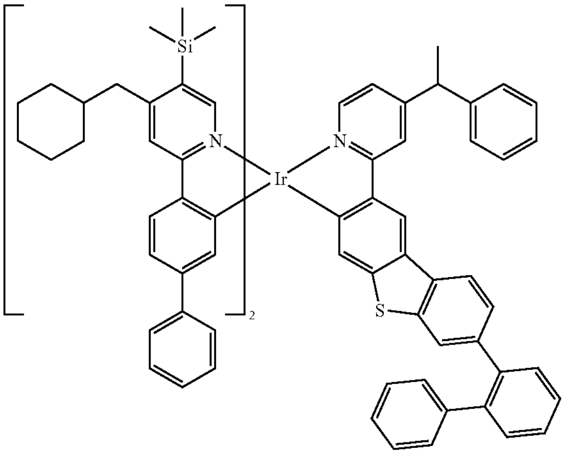
1691
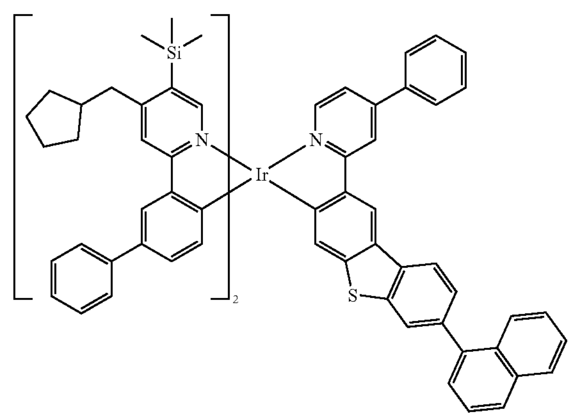

-continued
1692
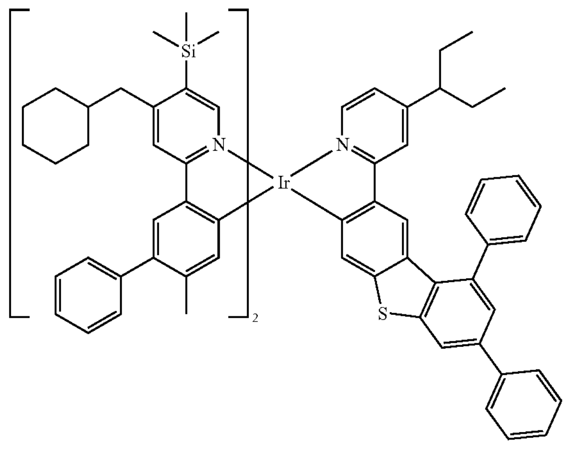
1693
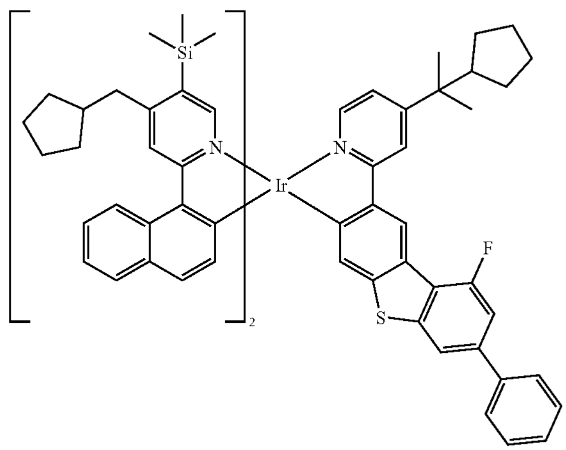
1694
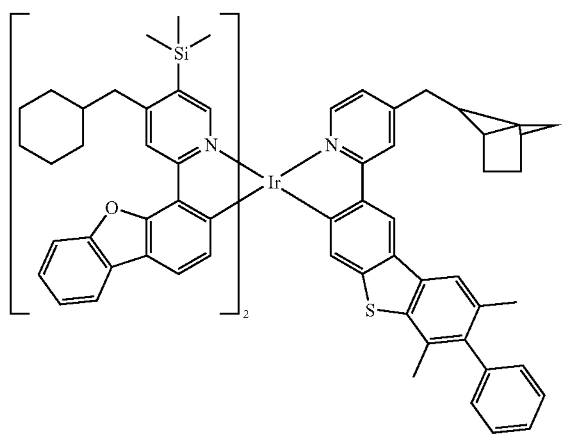
-continued
1695
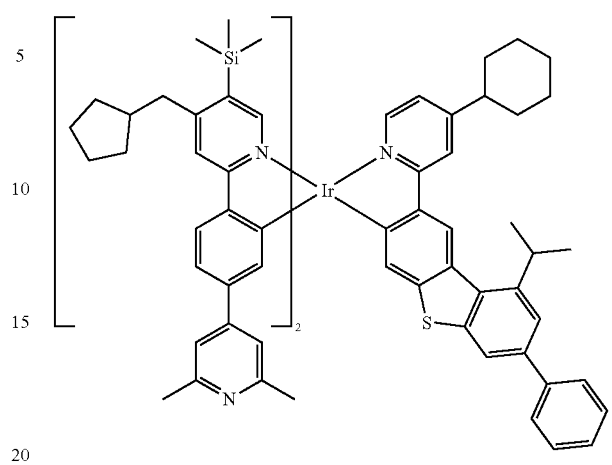
1696
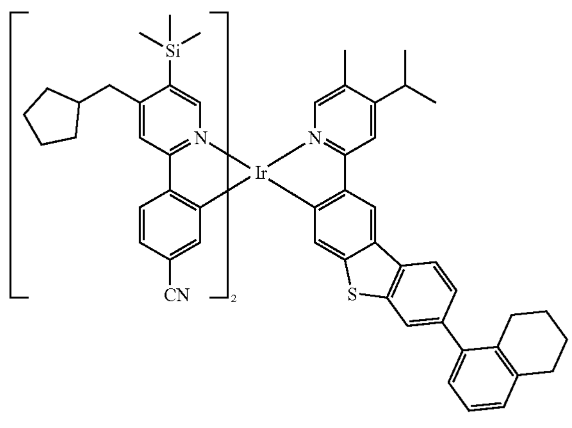
1697
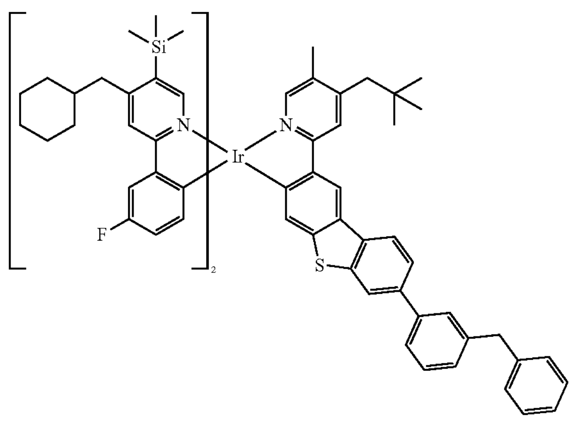

-continued
1698
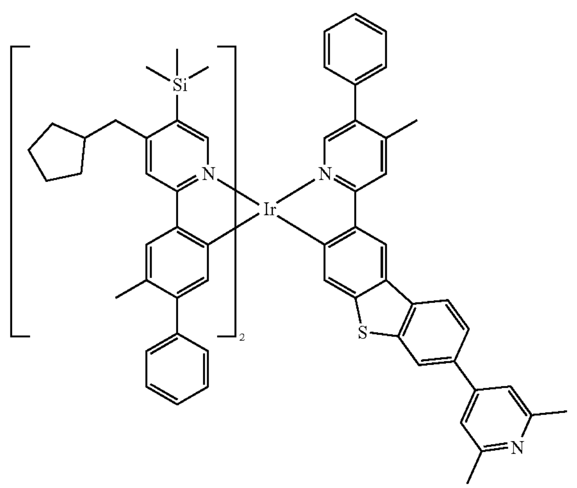
1699
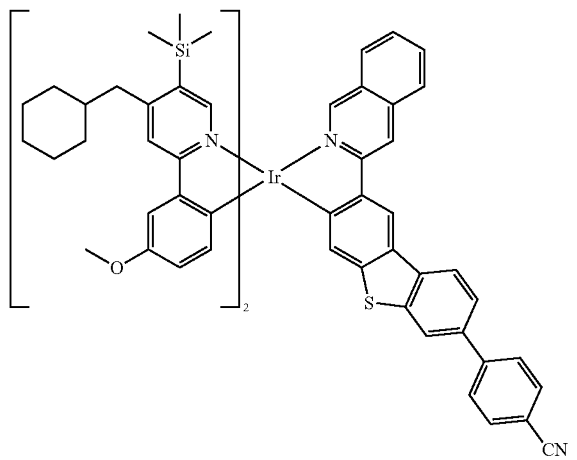
1700
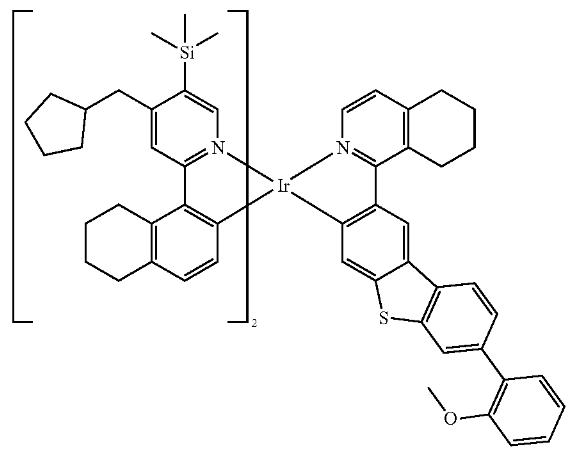
-continued
1701
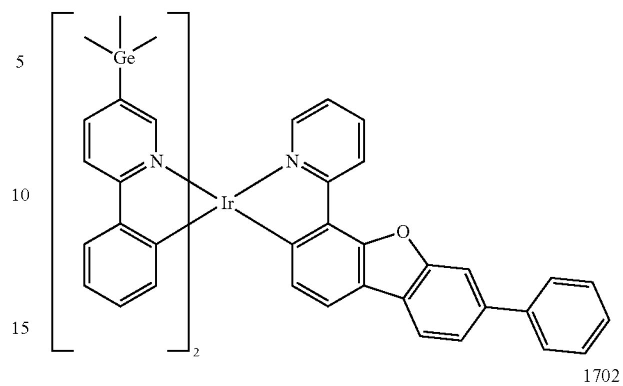
1702
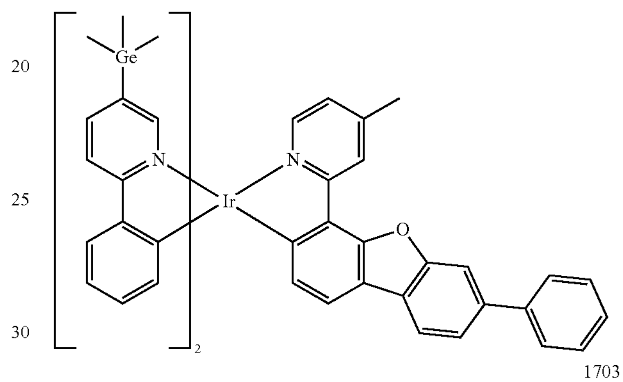
1703
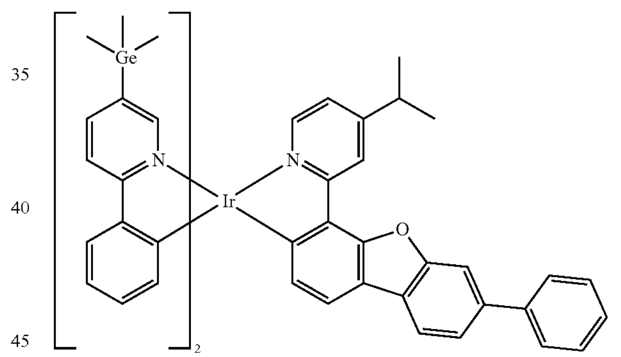
1704
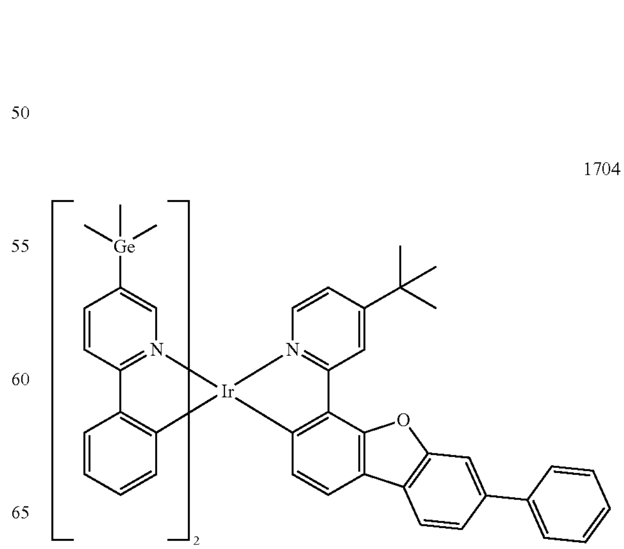

-continued
1705
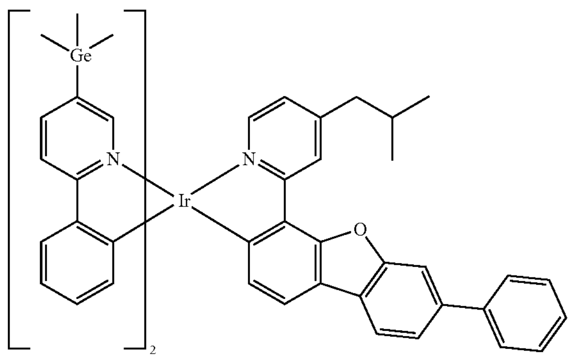
1706
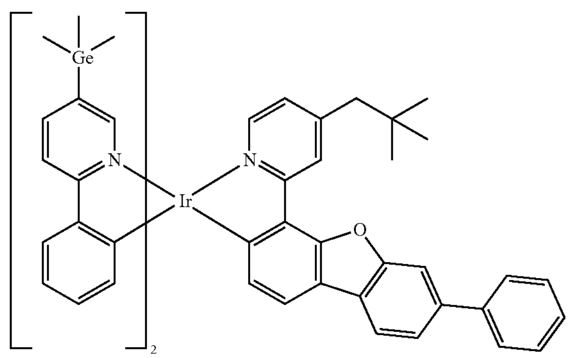
1707
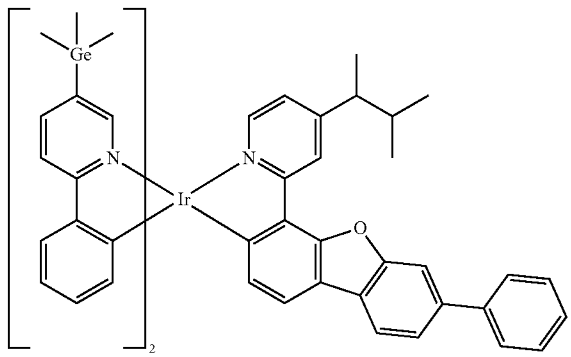
1708
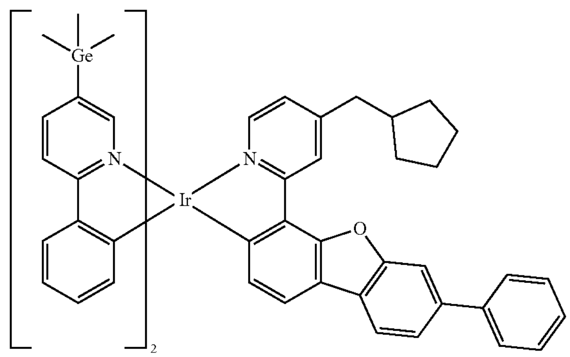
-continued
1709
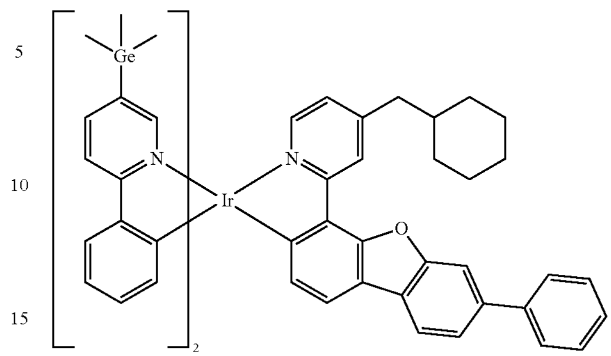
1710
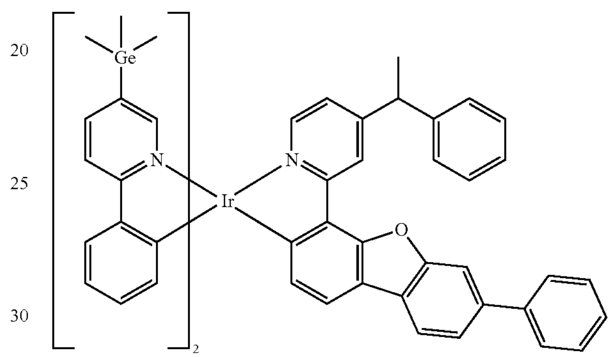
1711
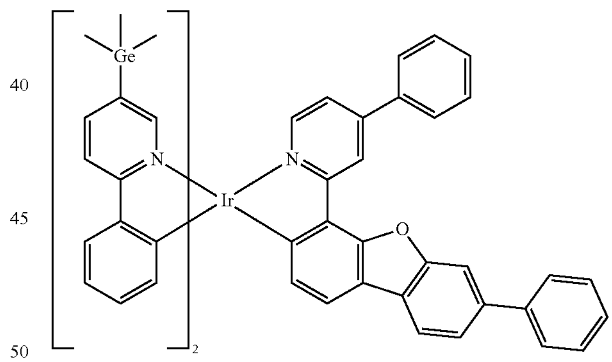
1712
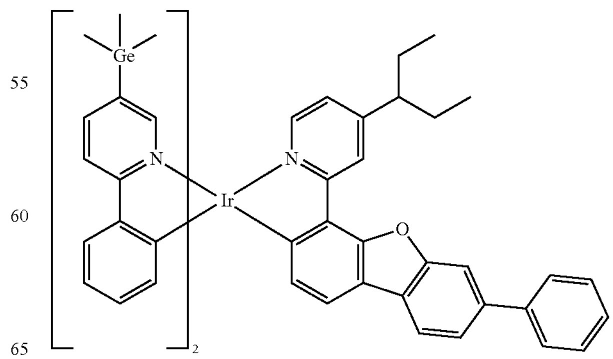

-continued
1713
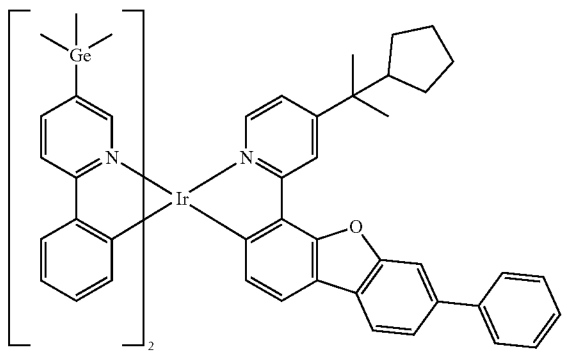
1714
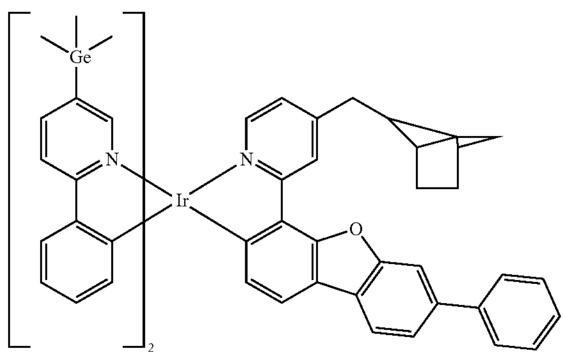
1715
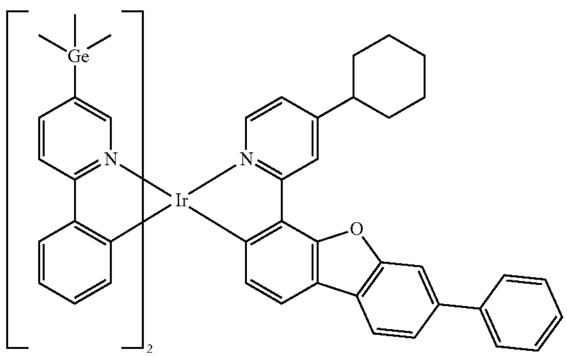
1716
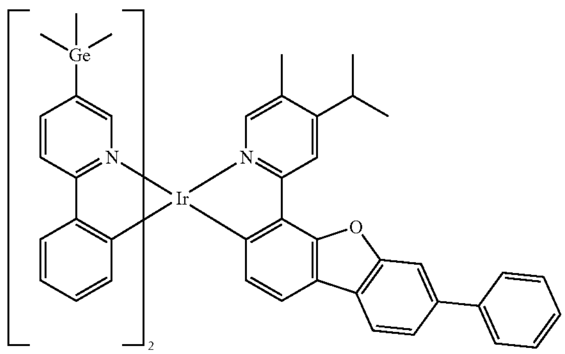
-continued
1717
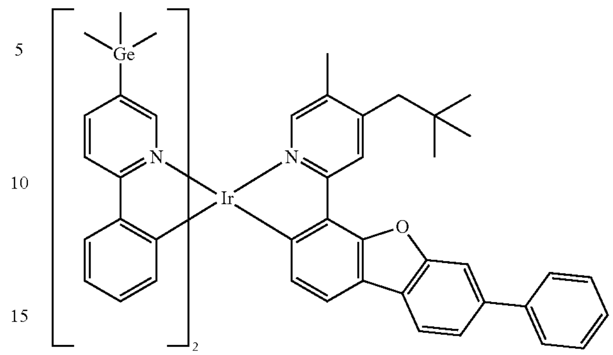
1718
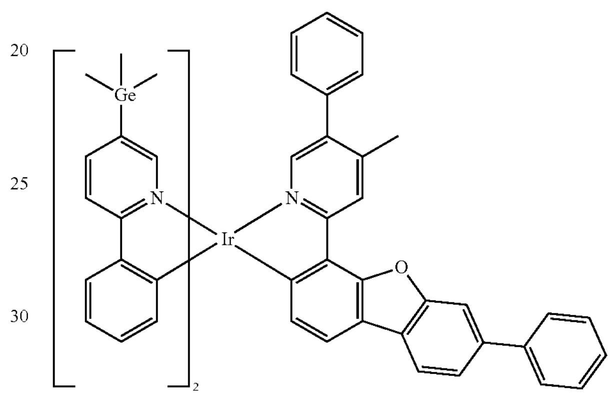
1719
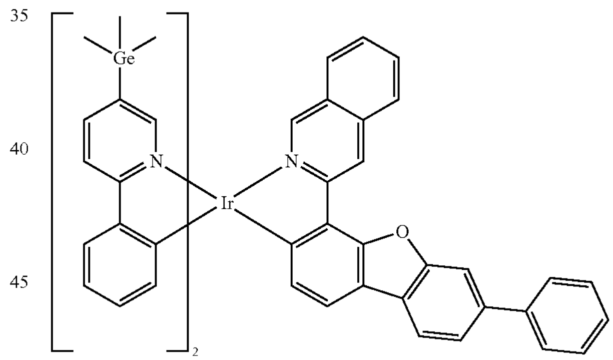
1720
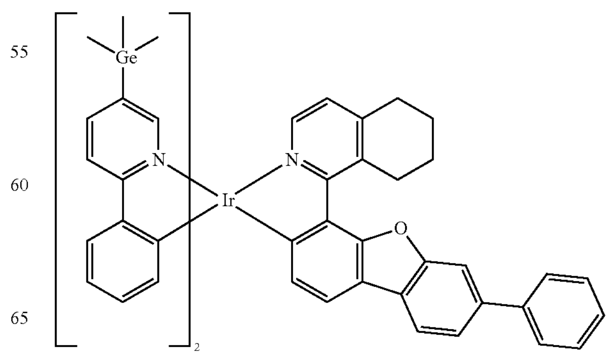

-continued
1721
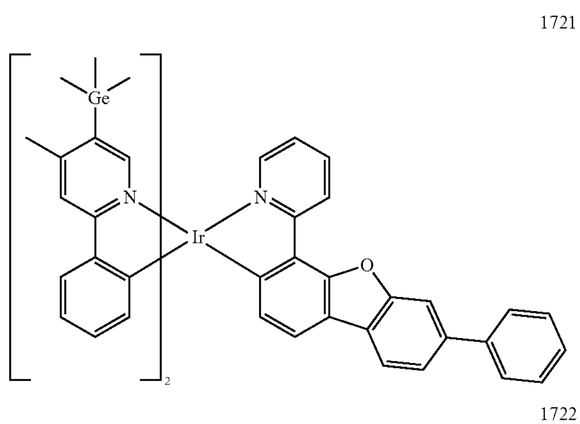
1722
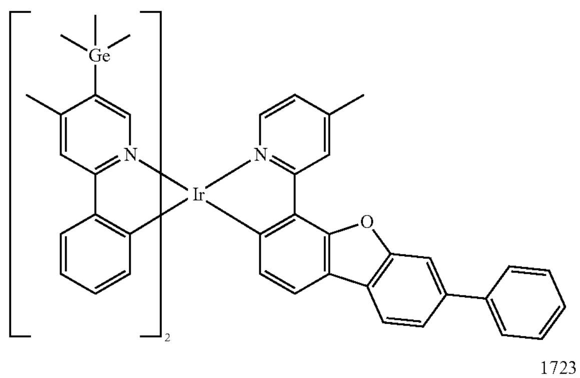
1723
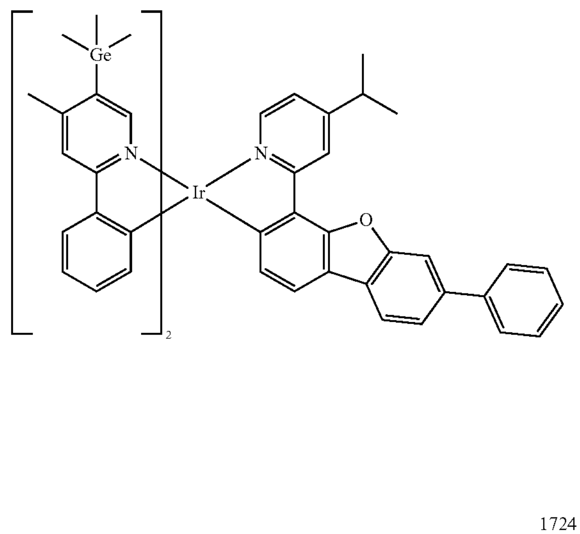
1724
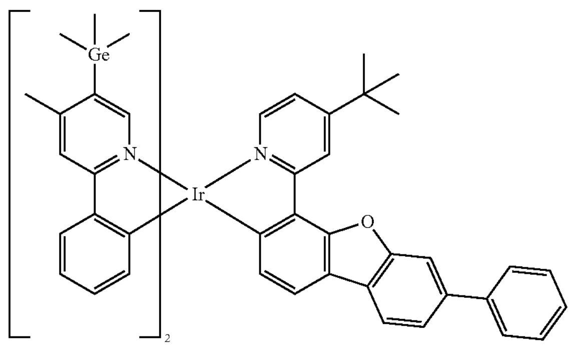
-continued
1725
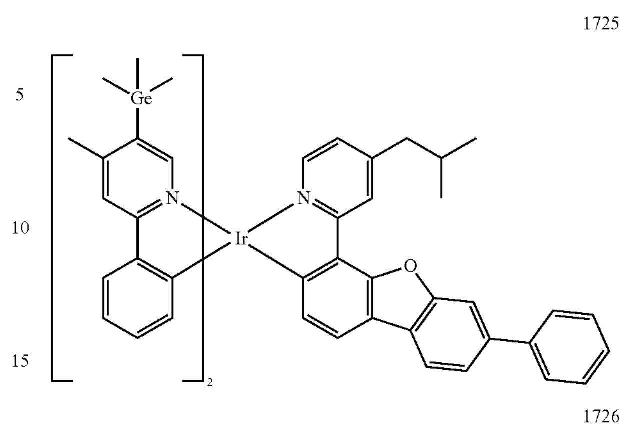
1726
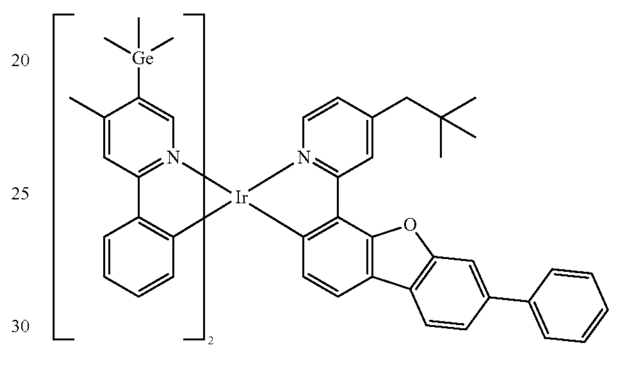
1727
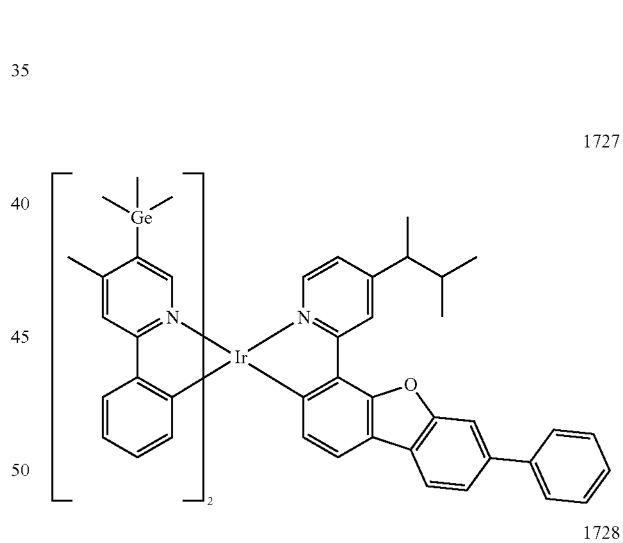
1728
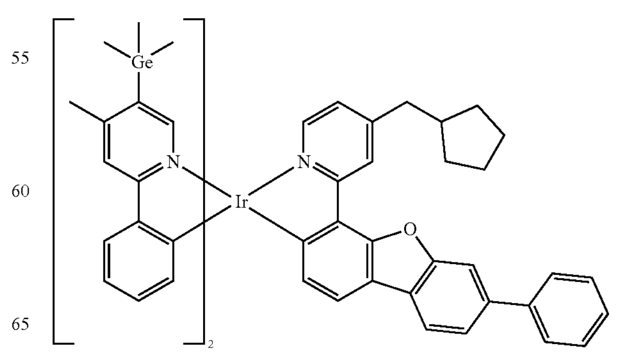

-continued
1729
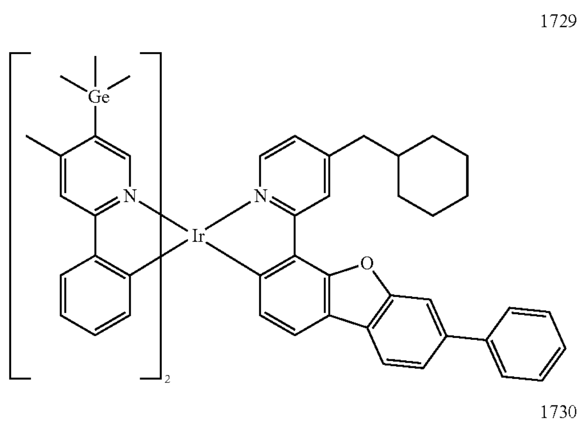
1730
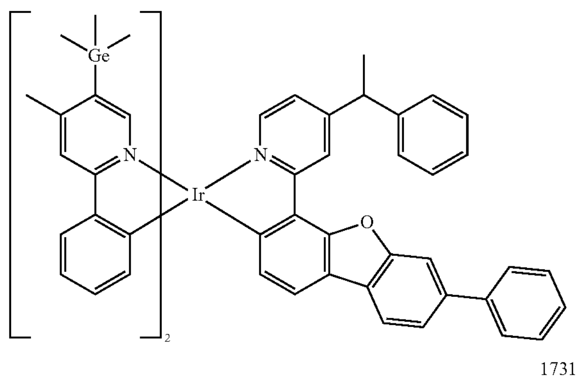
1731
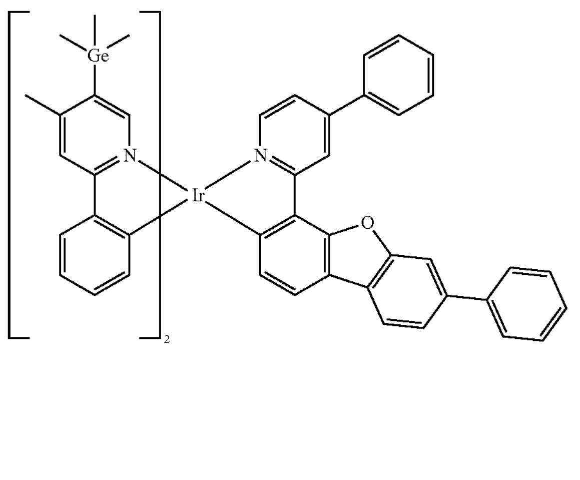
1732
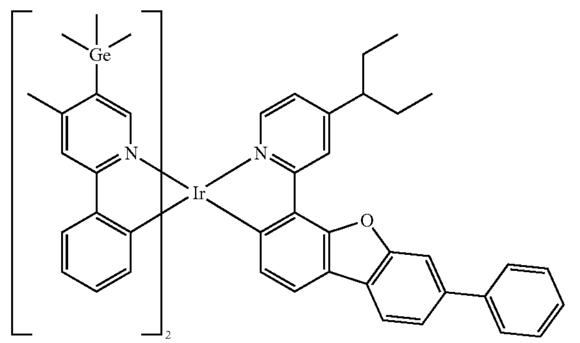
-continued
1733
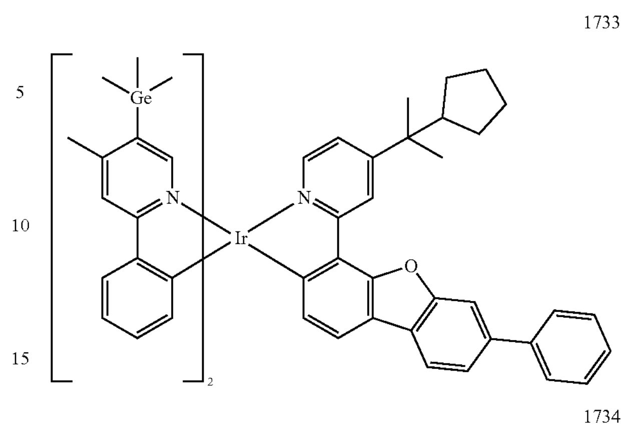
1734
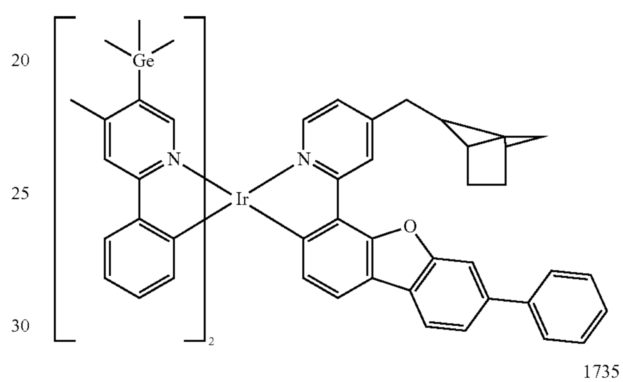
1735
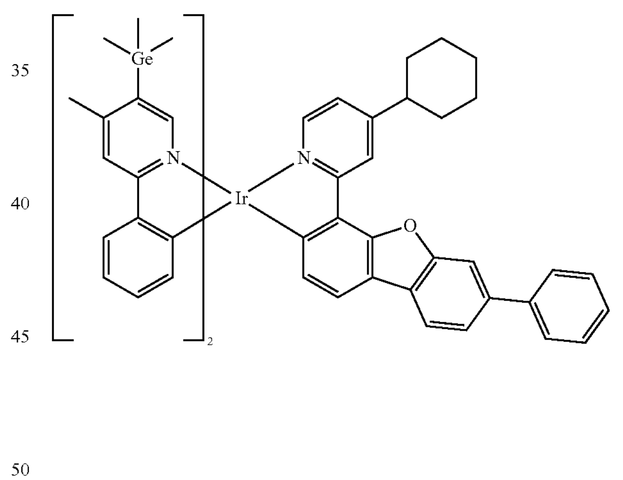
1736
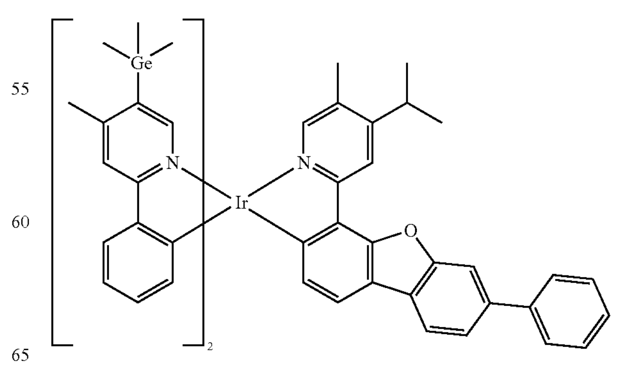

-continued
1737
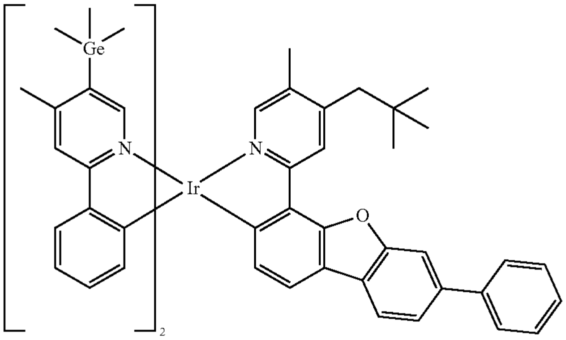
1738
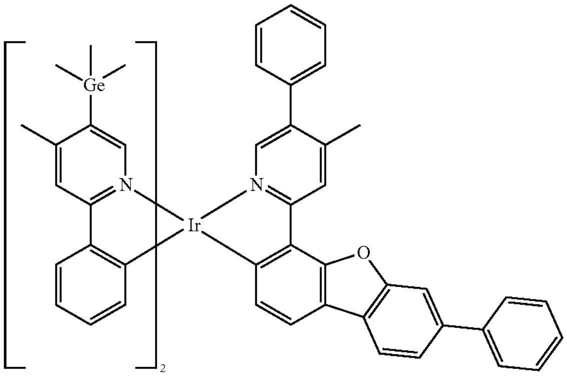
1739
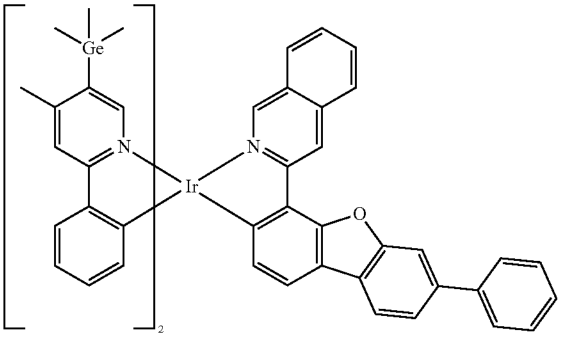
1740
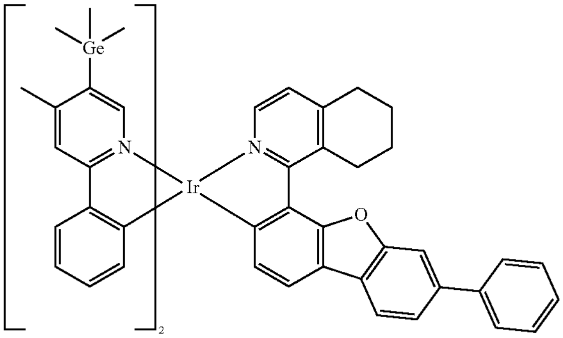
-continued
1741
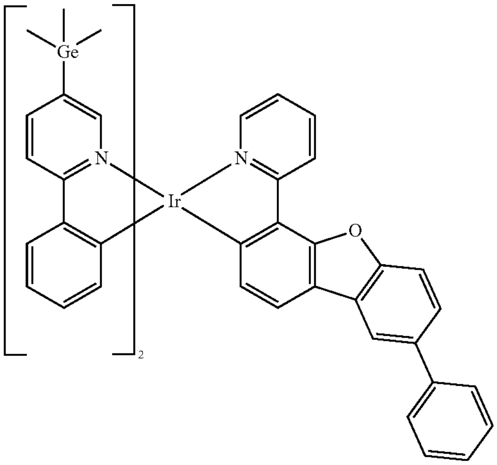
1742
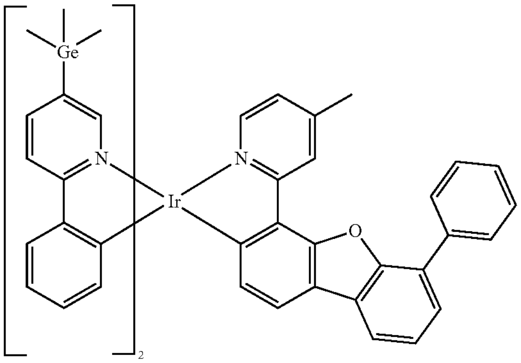
1743
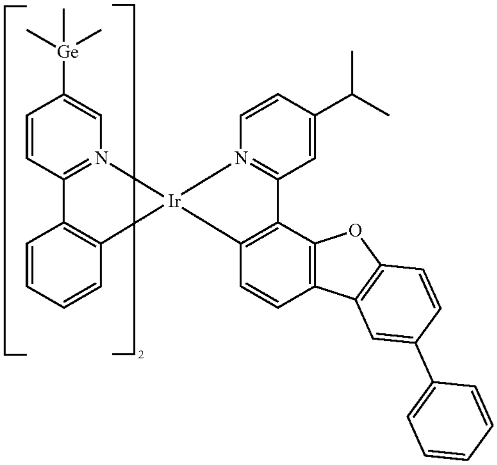

-continued
1744
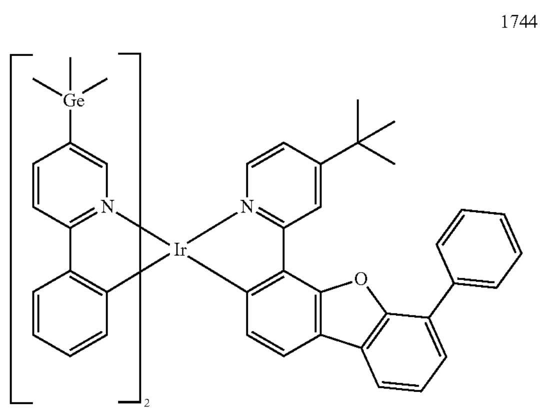
1745
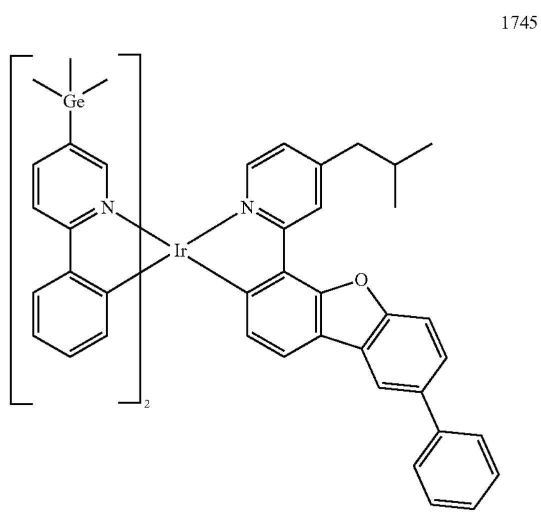
1746
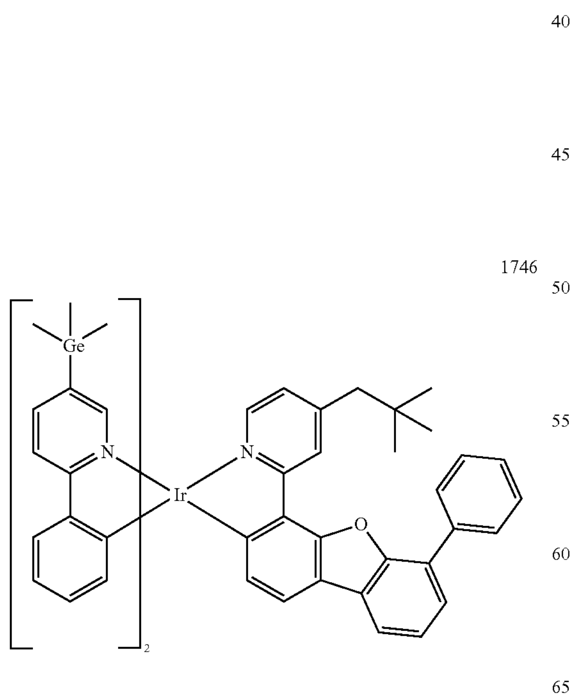
-continued
1747
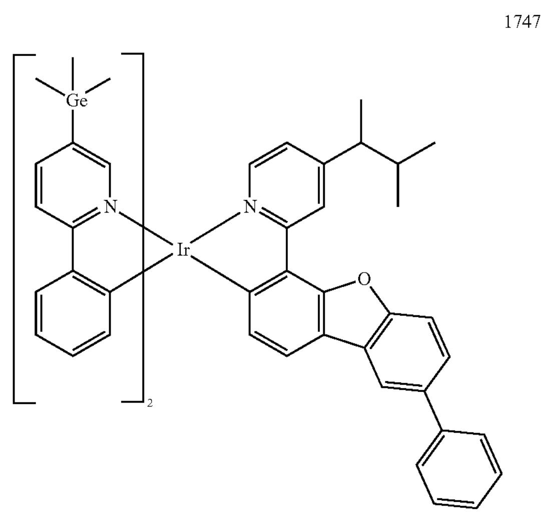
1748
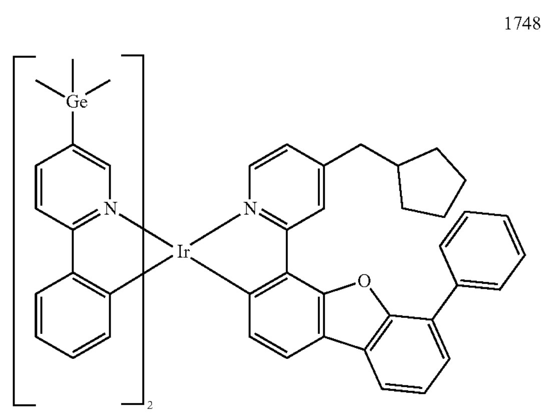
1749
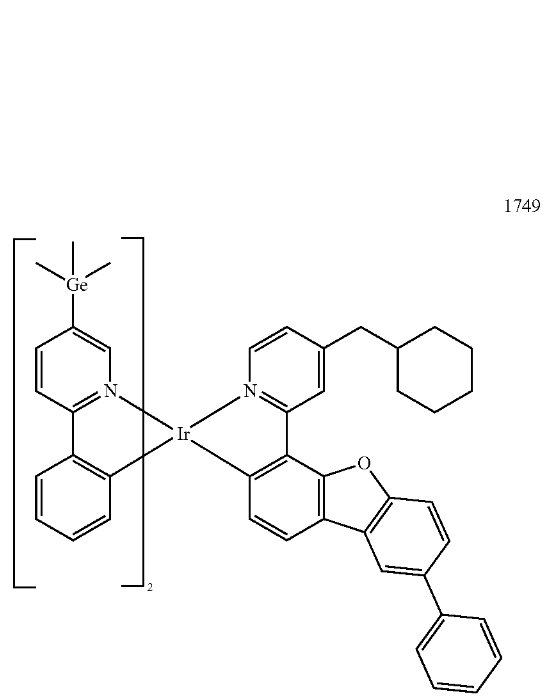

-continued
1750
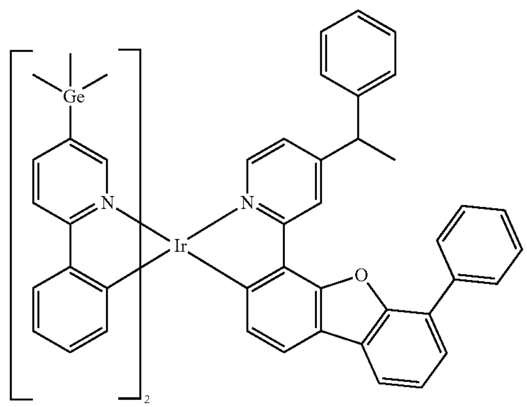
1751
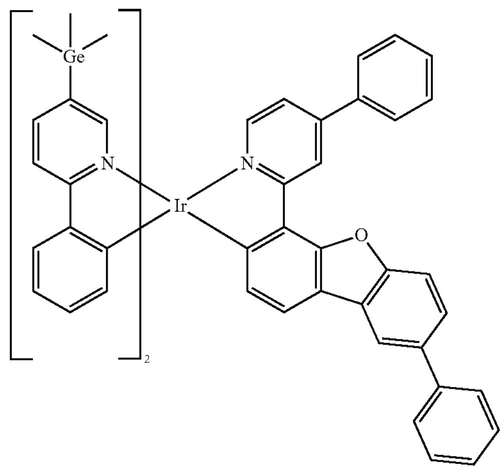
1752
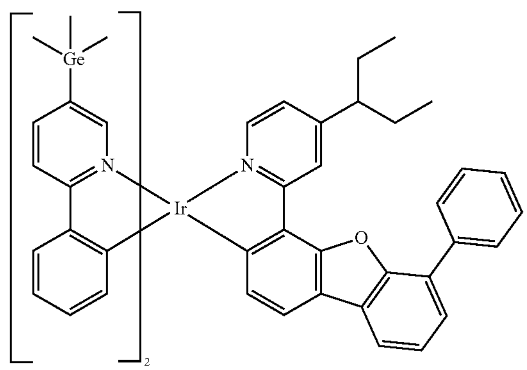
-continued
1753
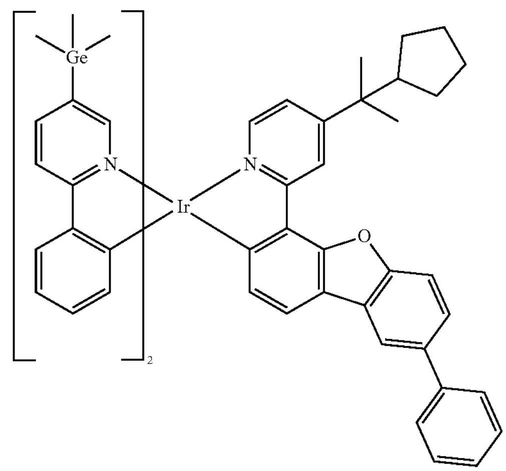
1754
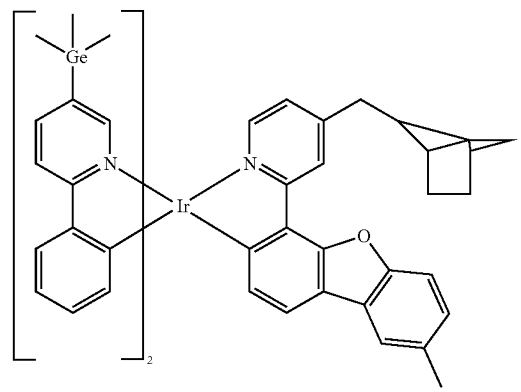
1755
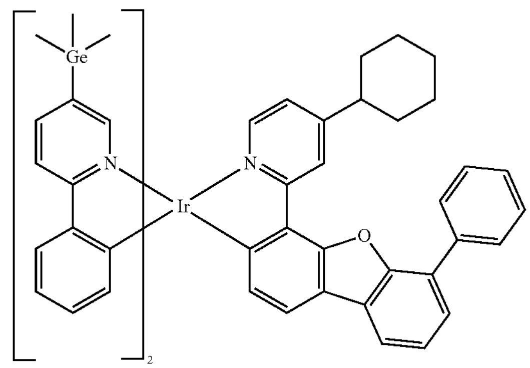

-continued
1756
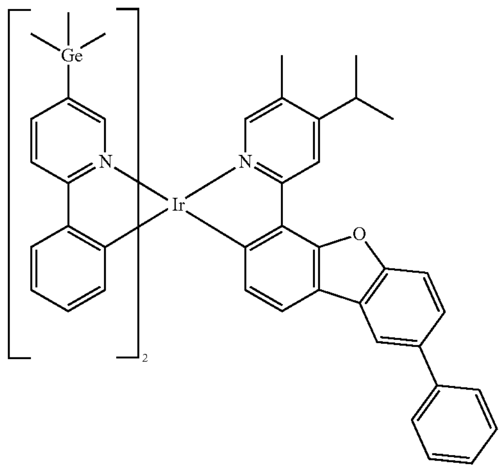
1757
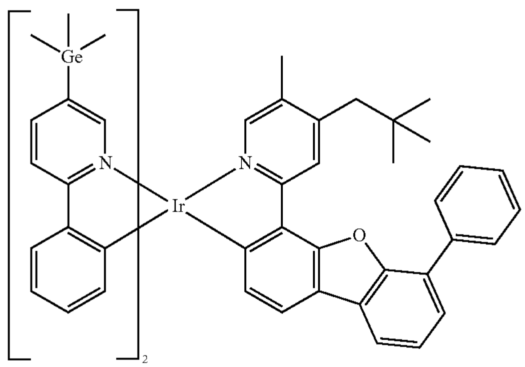
1758
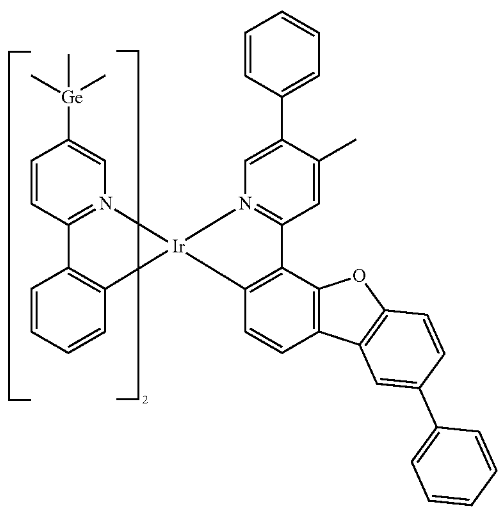
-continued
1759
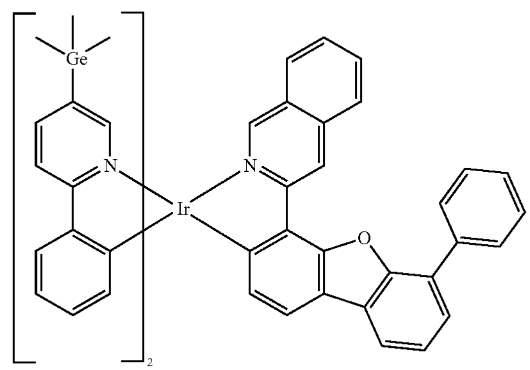
1759
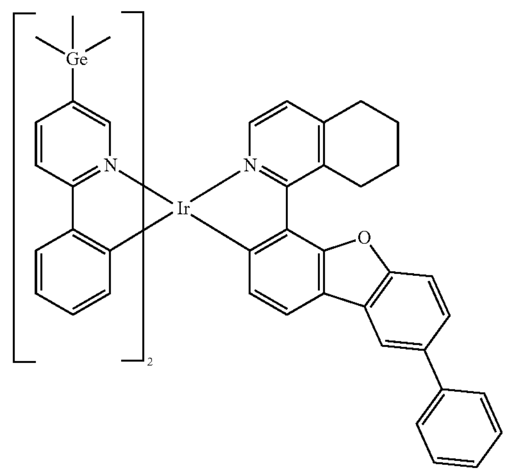
1760
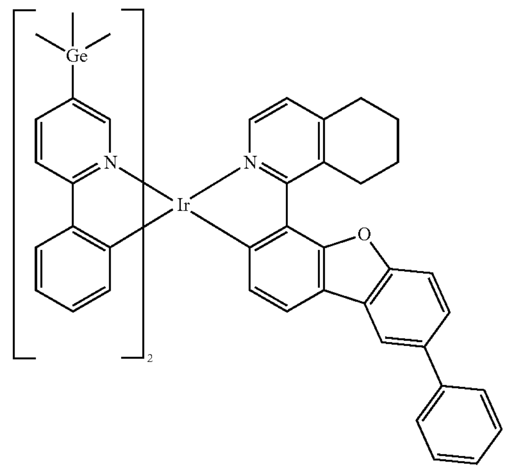

-continued
1761
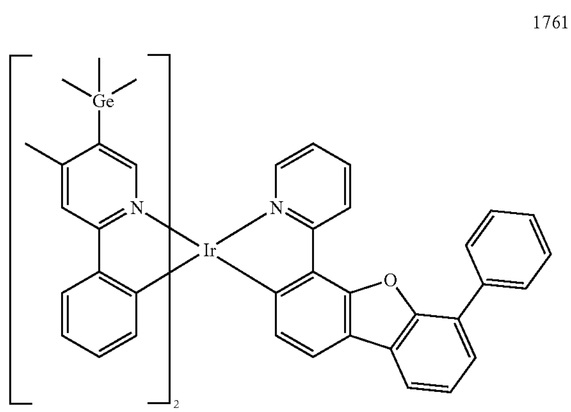
1762
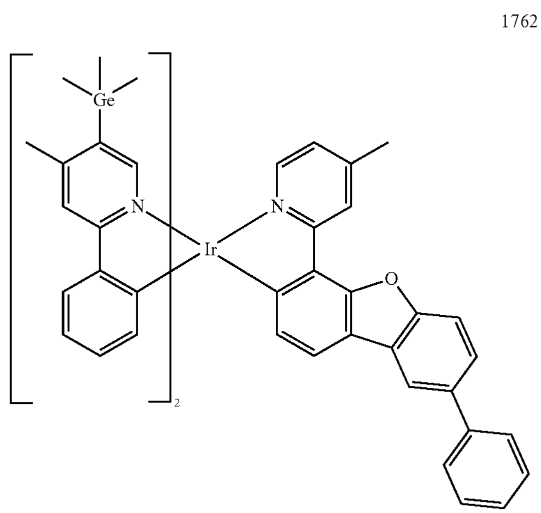
1763
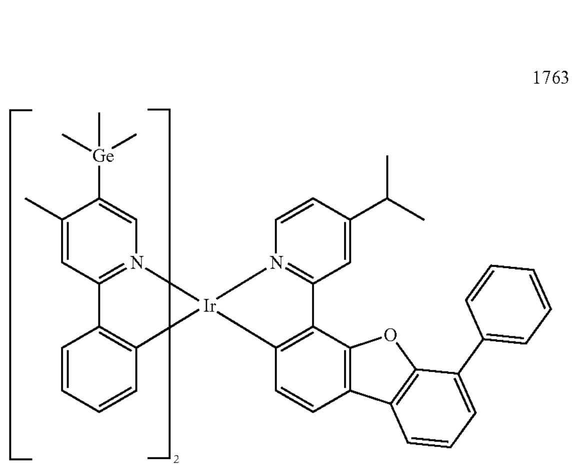
-continued
1764
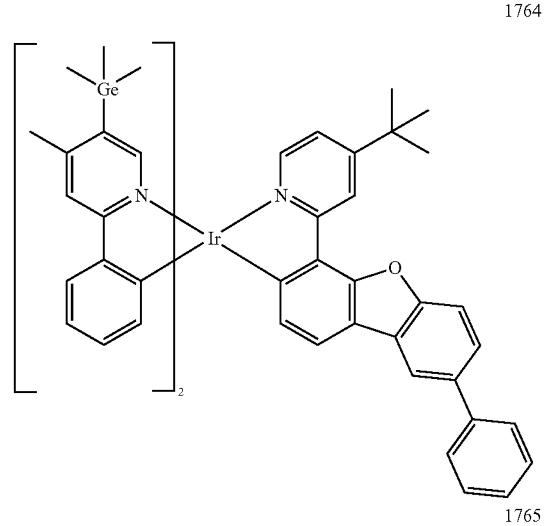
1765
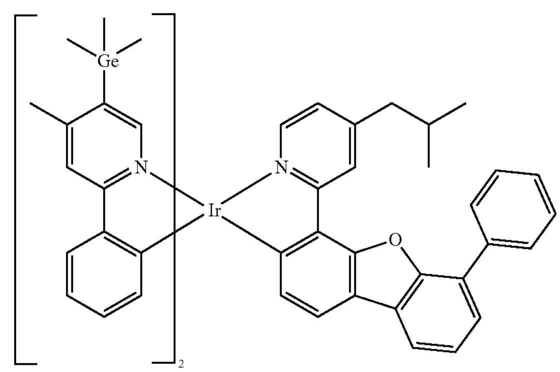
1766
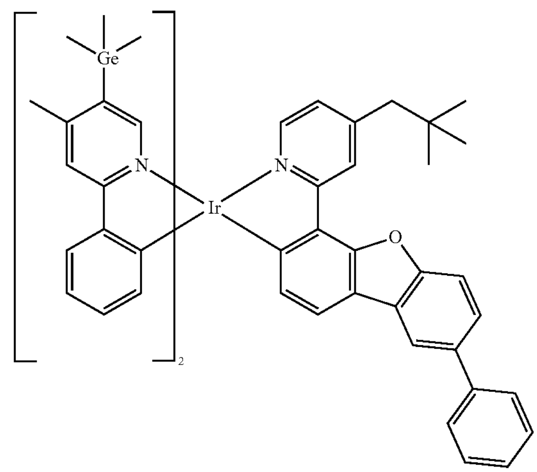

-continued
1767
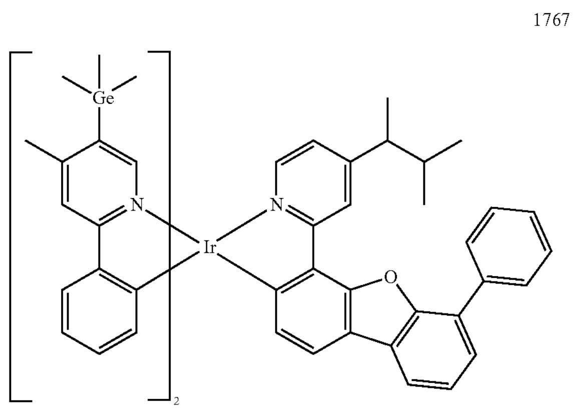
1768
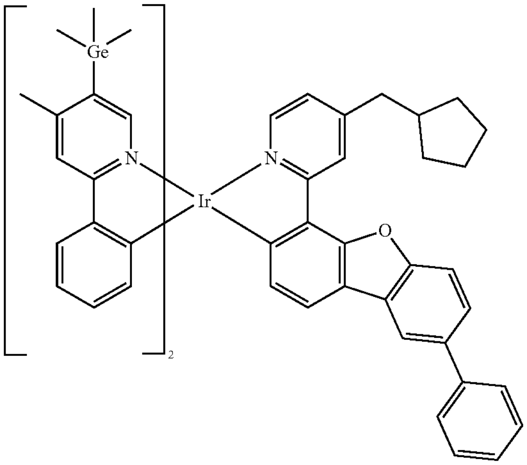
1769
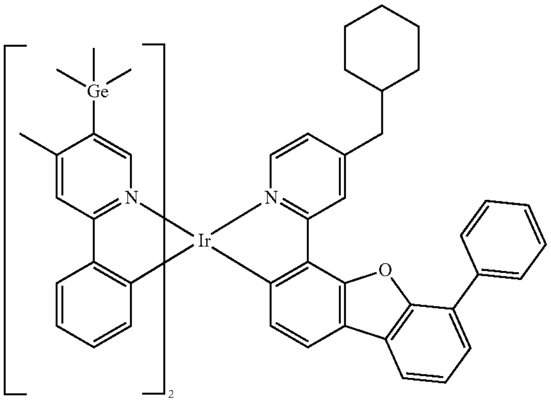
-continued
1770
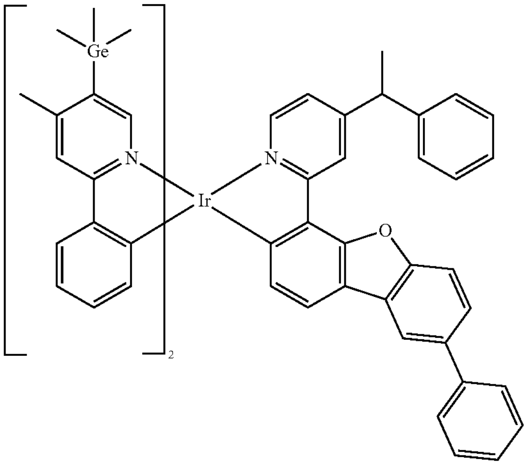
1771
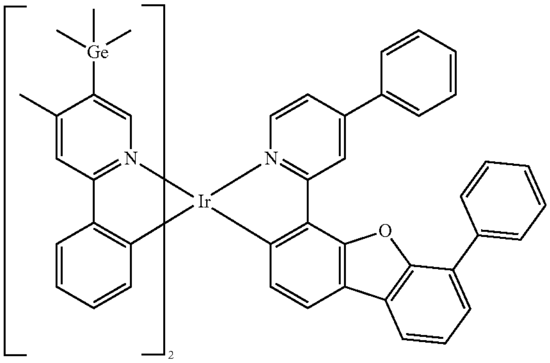
1772
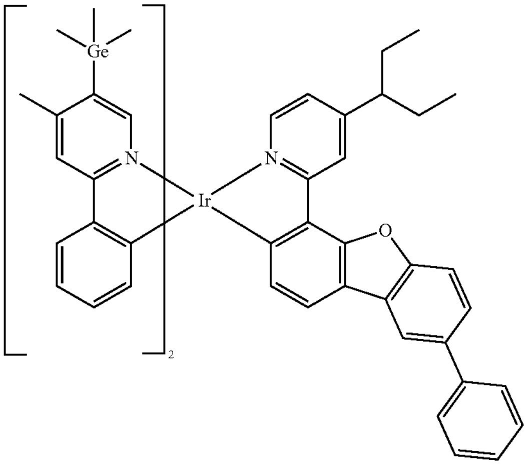

-continued
1773
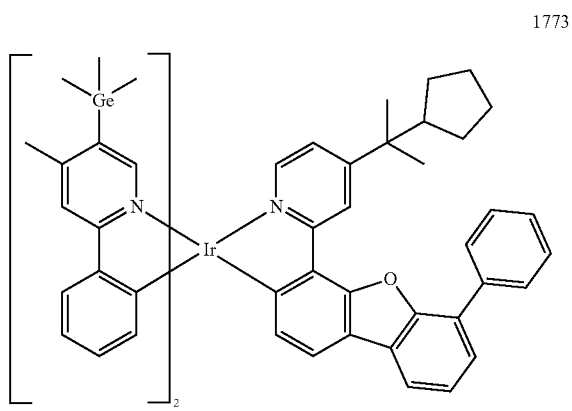
1774
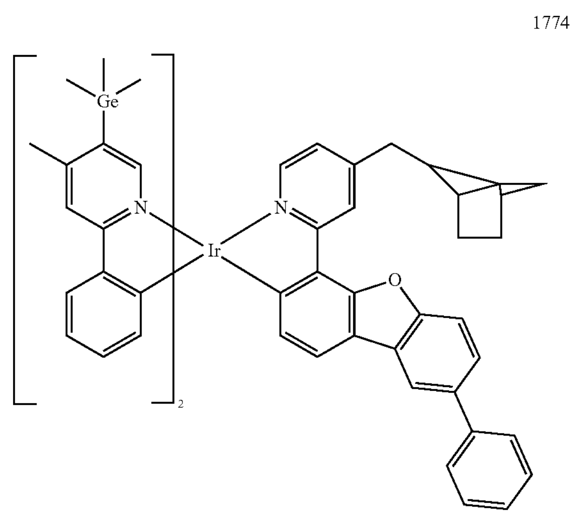
1775
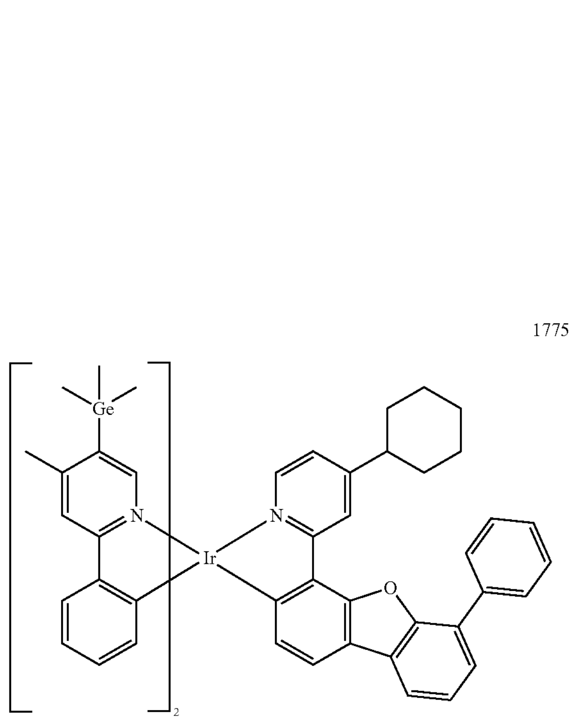
-continued
1776
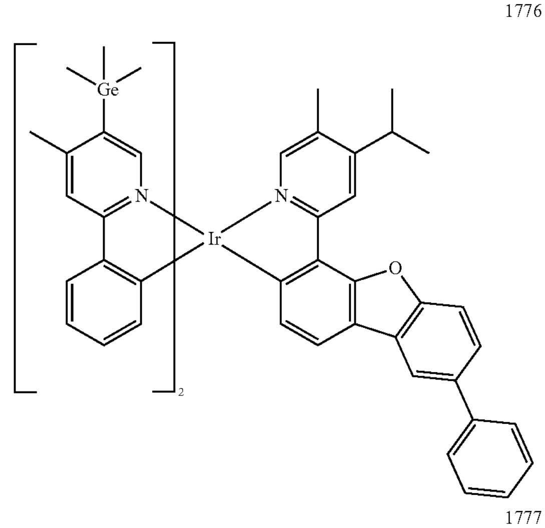
1777
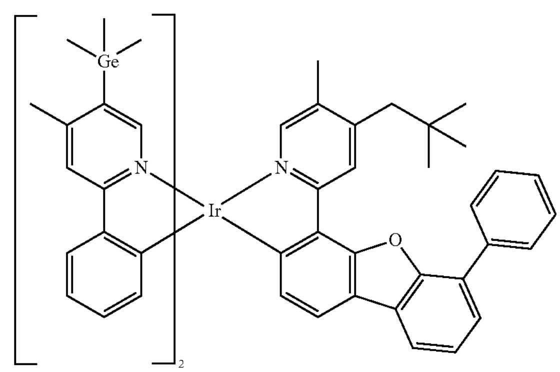
1778
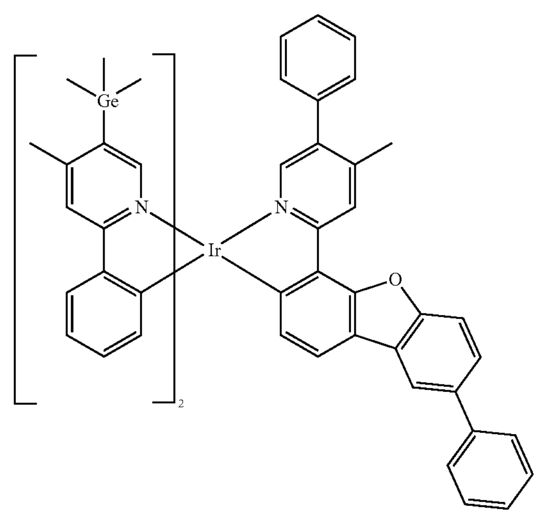

-continued
1779
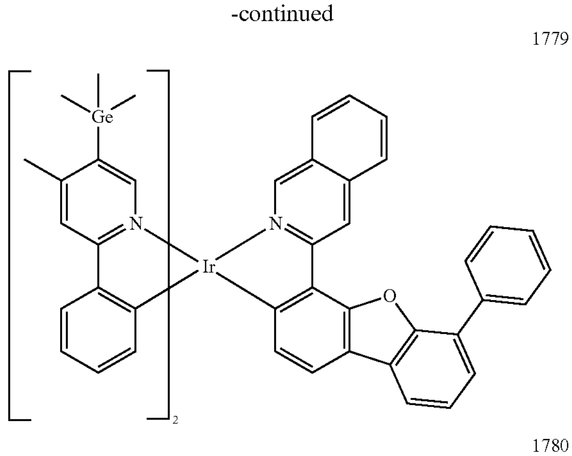
1780
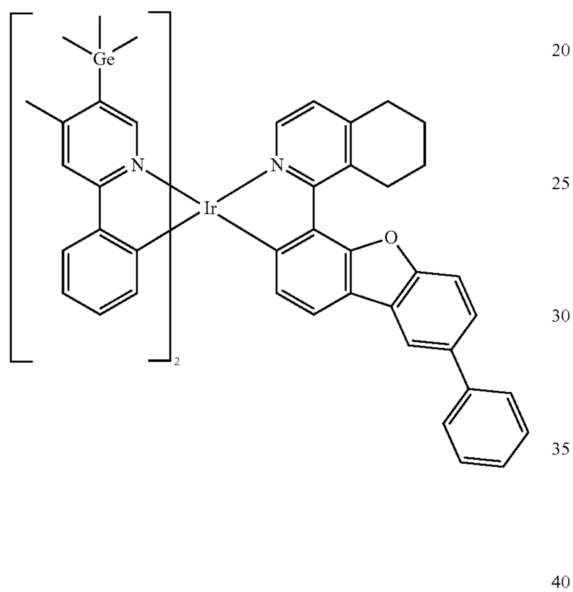
1781
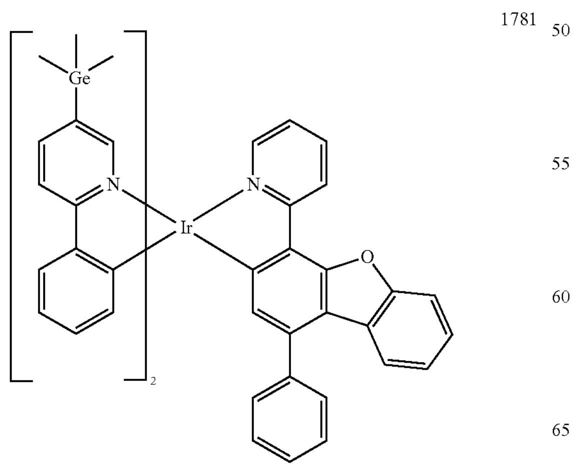
-continued
1782
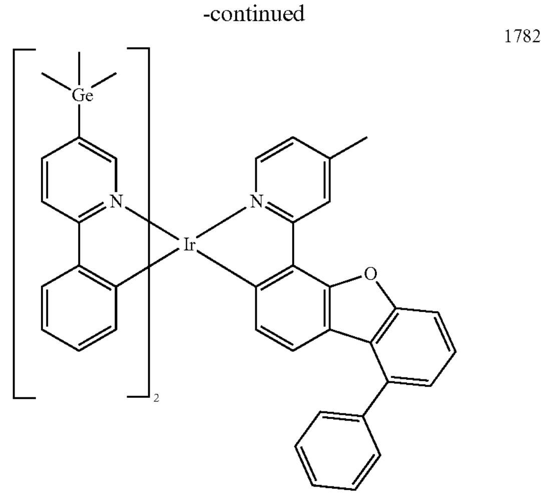
1783
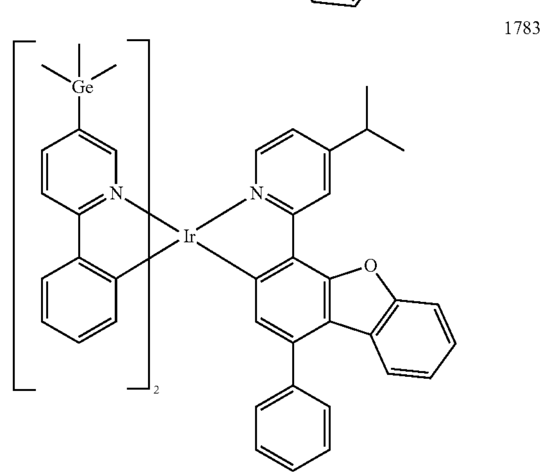
1784
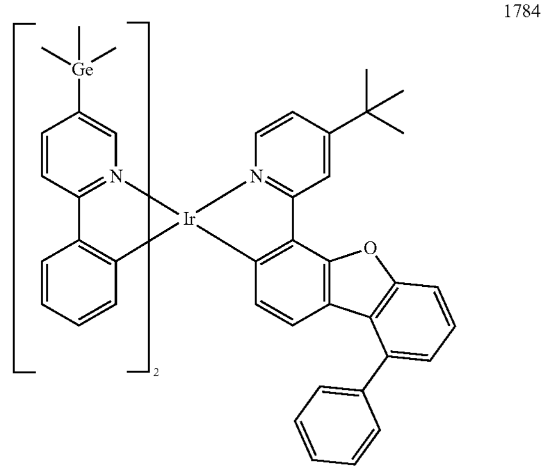

-continued
1785
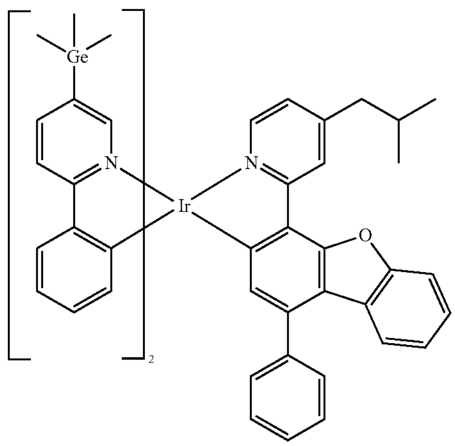
1786
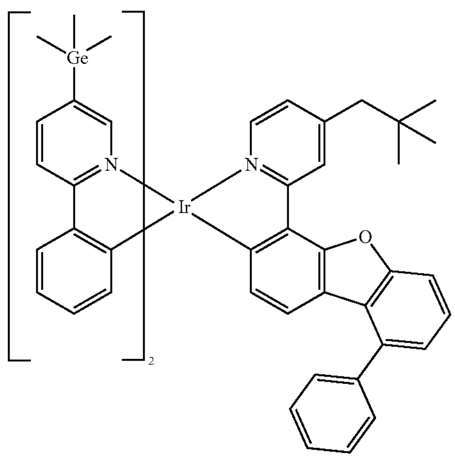
1787
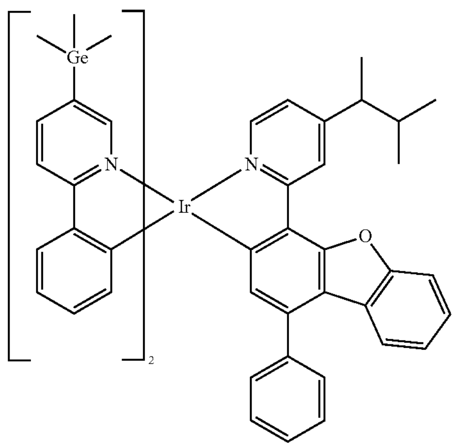
-continued
1788
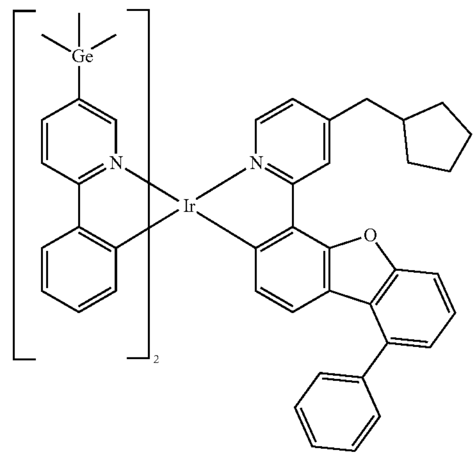
1789
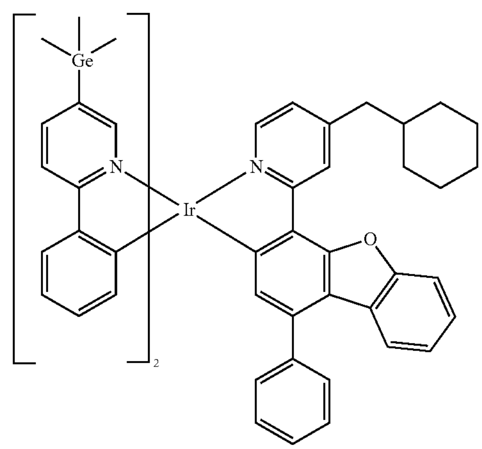
1790
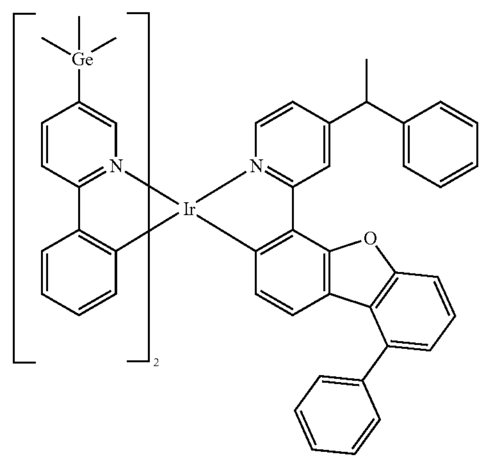

-continued
1791
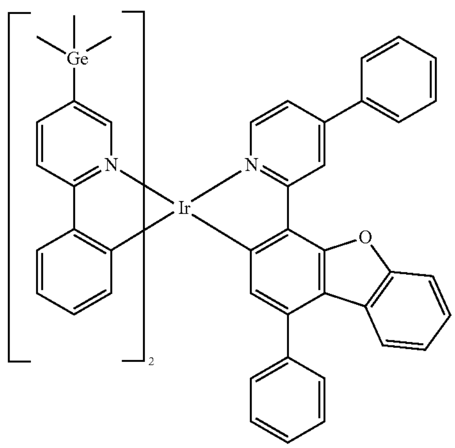
1792
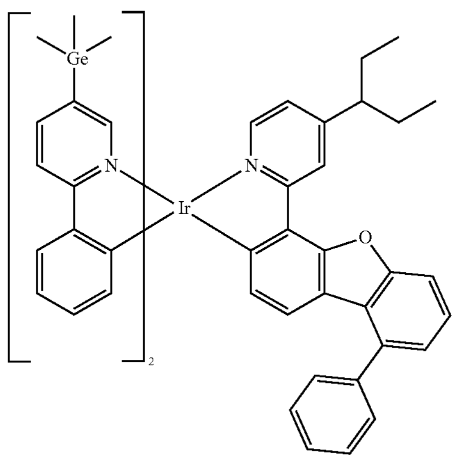
1793
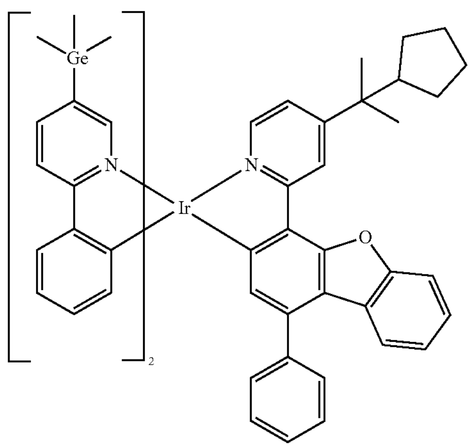
1794
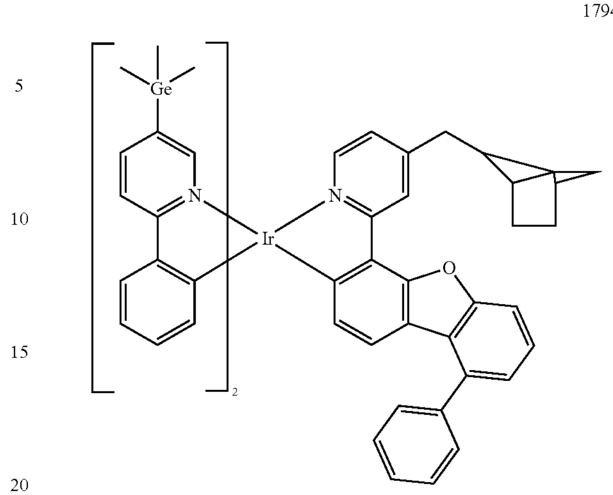
1795
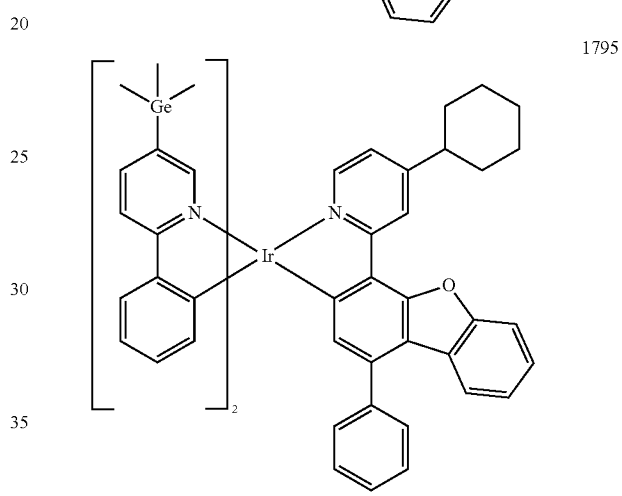
1796
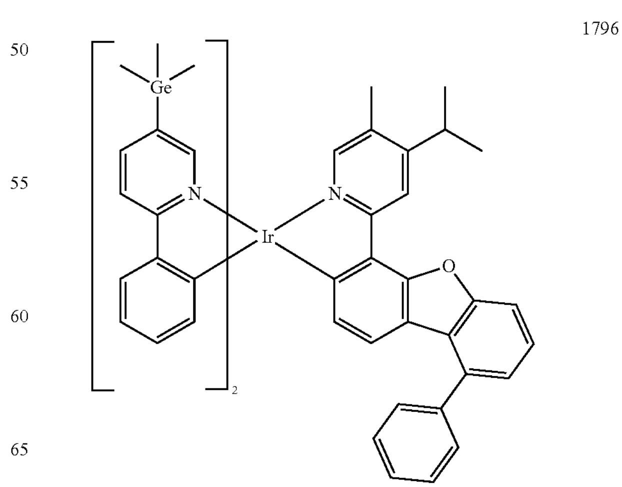

-continued
1797
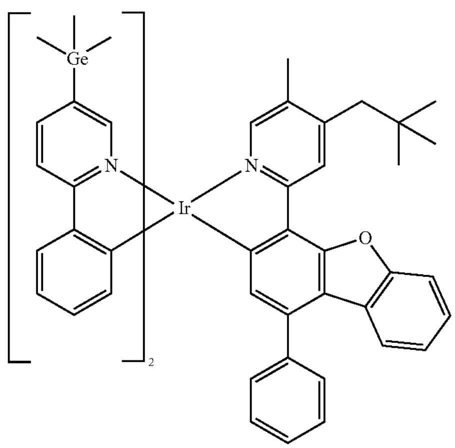
1798
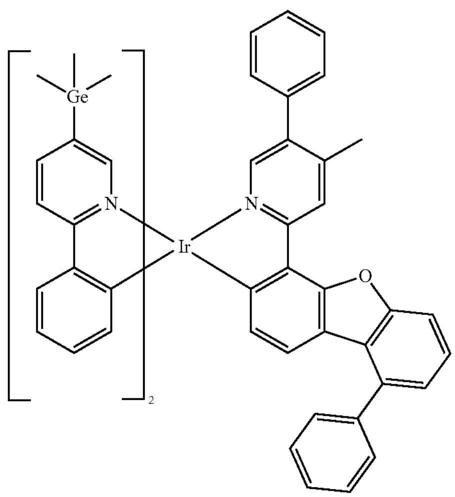
1799
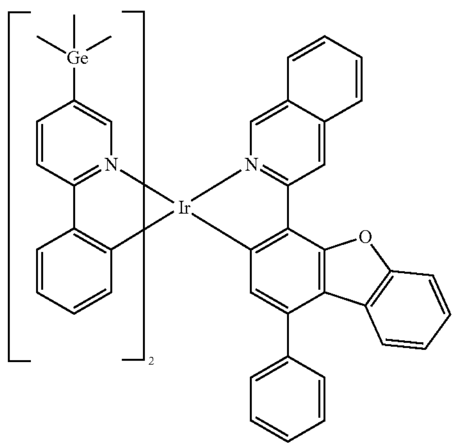
-continued
1800
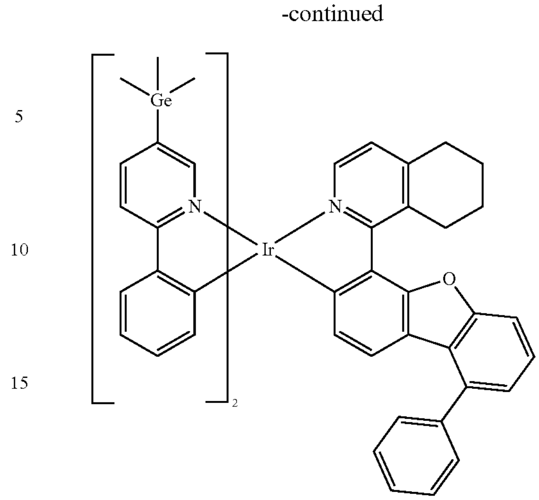
1801
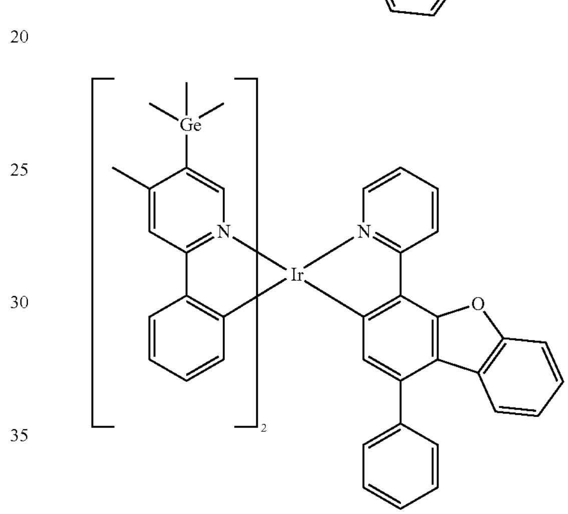
1802
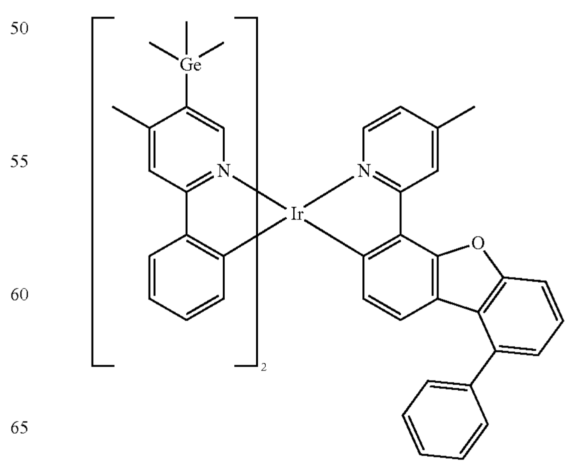

-continued
1803
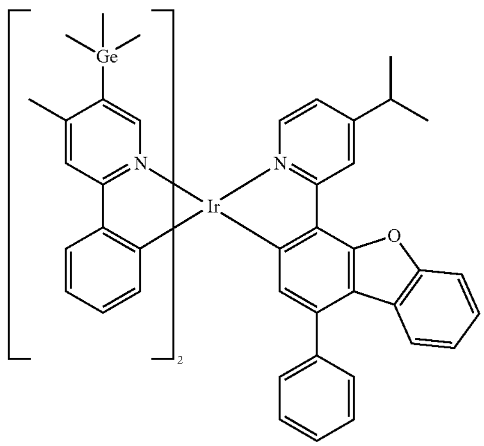
1804
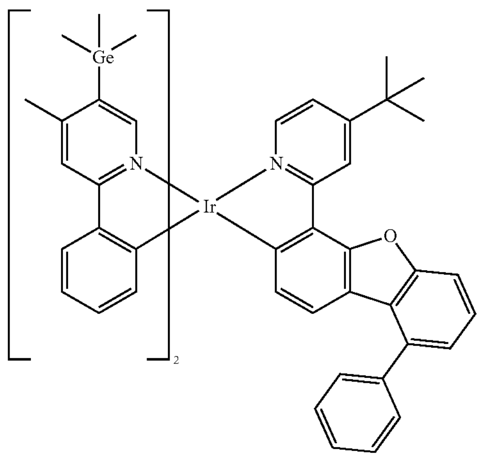
1805
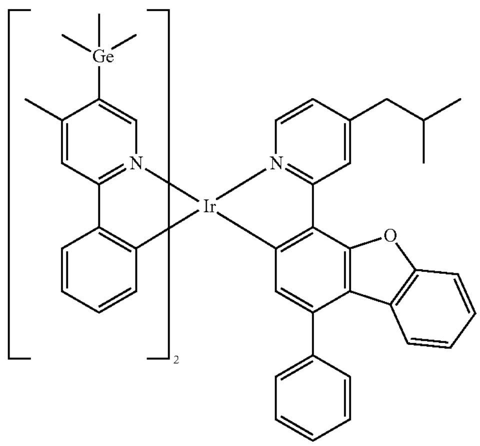
-continued
1806
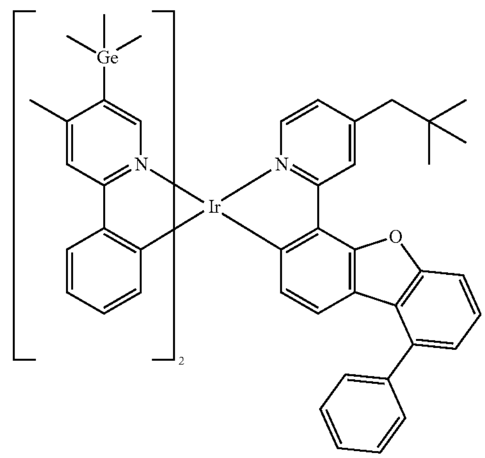
1807
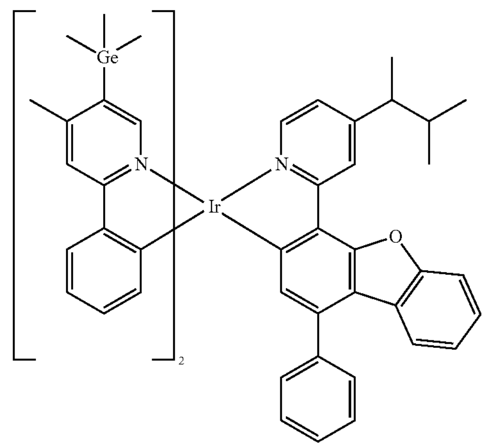
1808
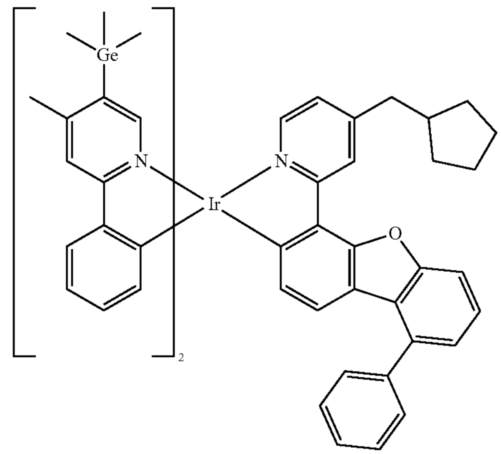

-continued
1809
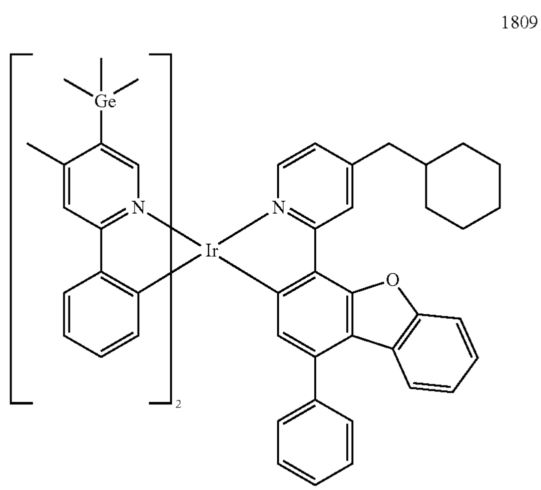
1810
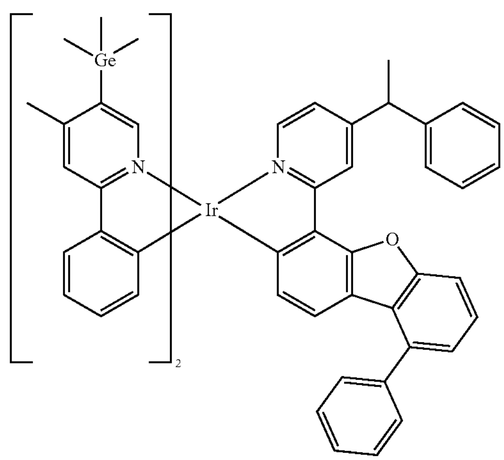
1811
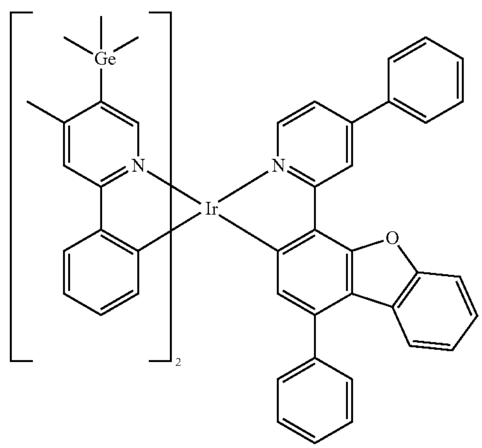
-continued
1812
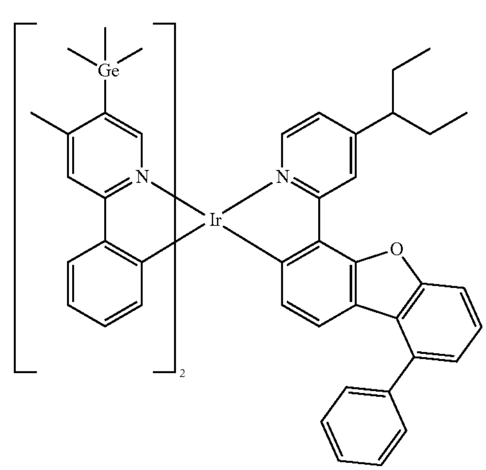
1813
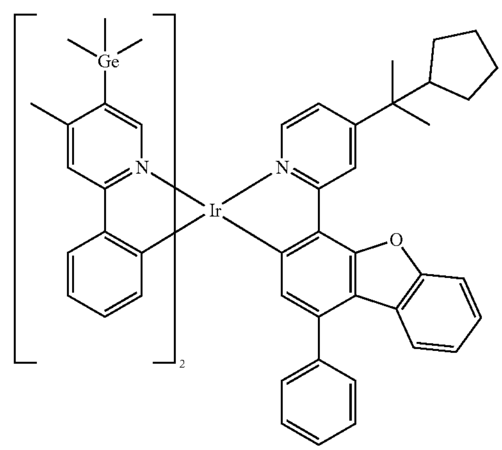
1814
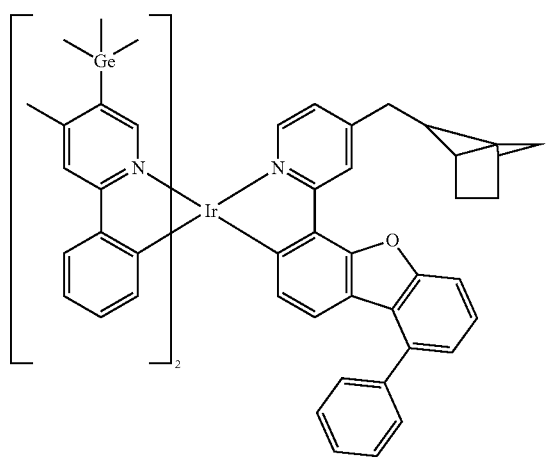

-continued
1815
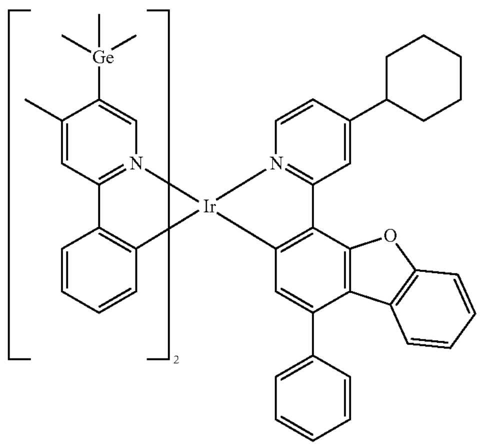
1816
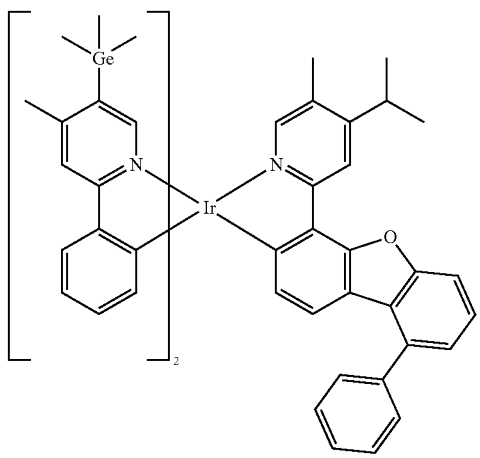
1817
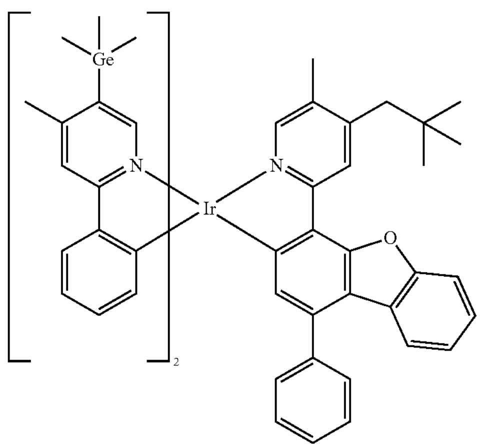
-continued
1818
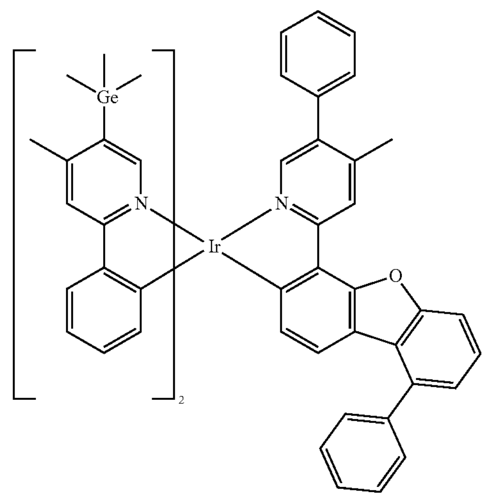
1819
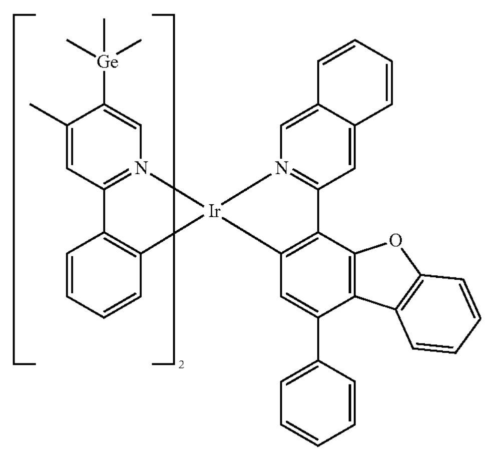
1820
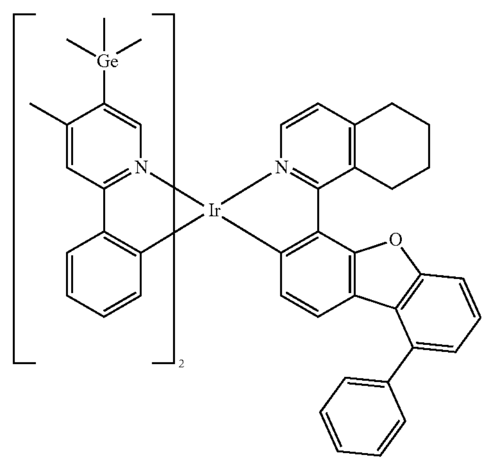

-continued
1821
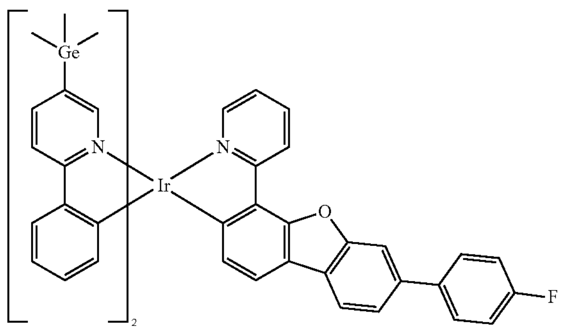
1822
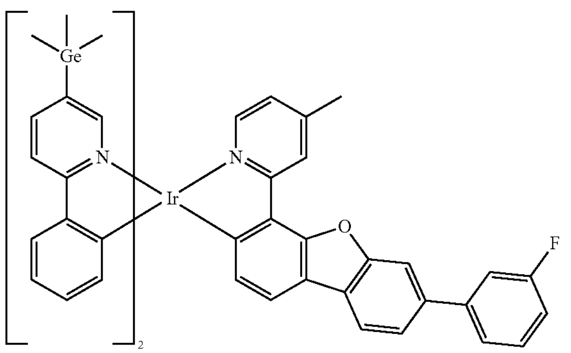
1823
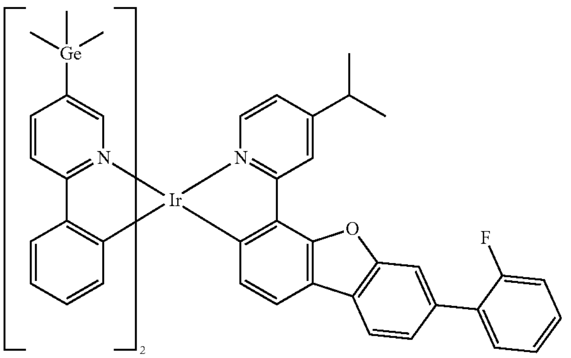
1824
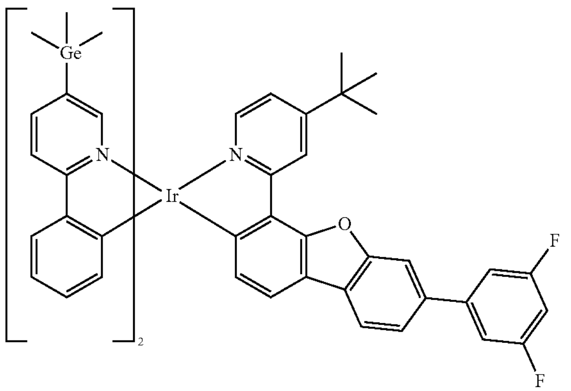
-continued
1825
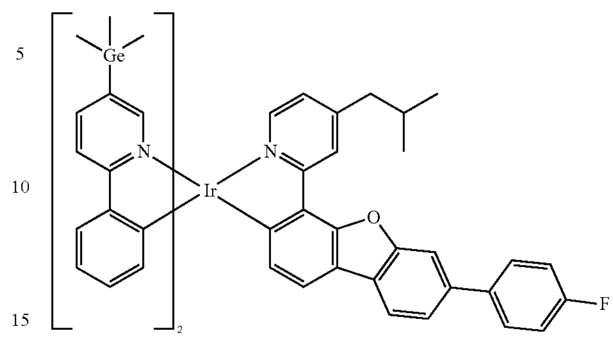
1826
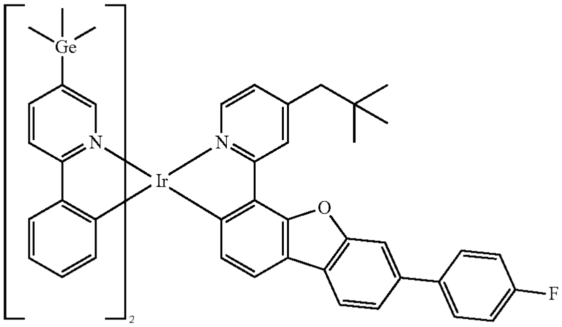
1827
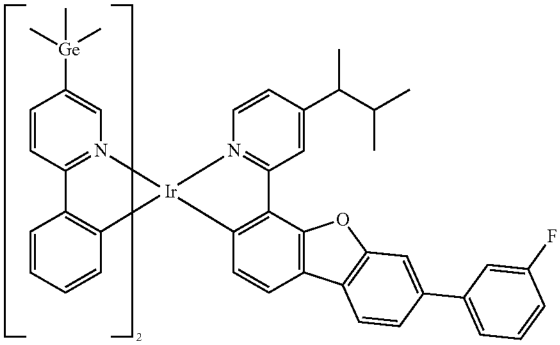
1828
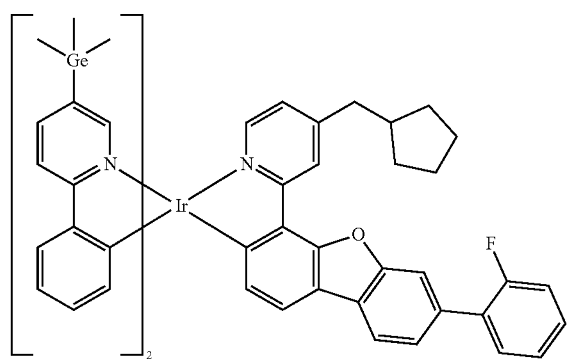

-continued
1829
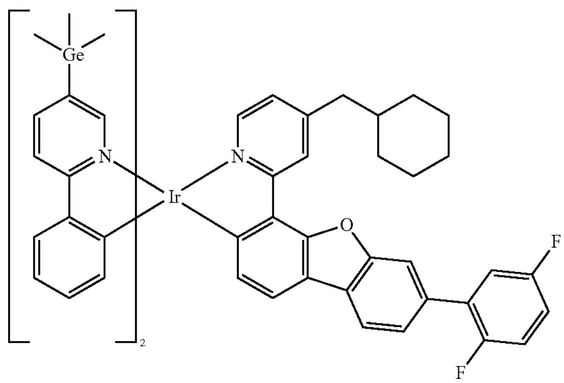
1830
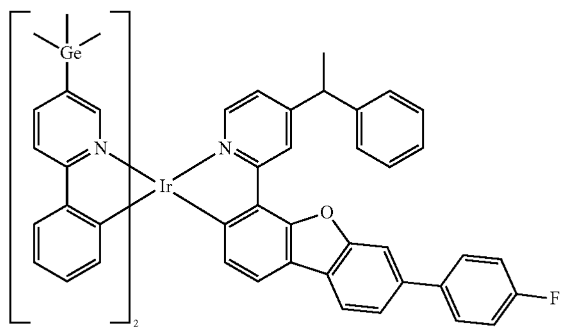
1831
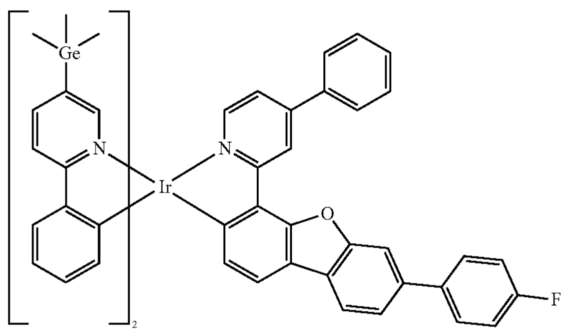
1832
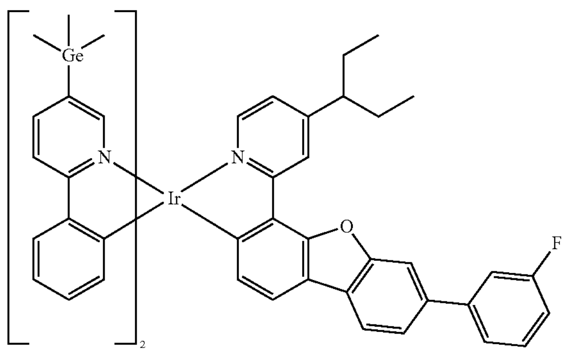
-continued
1833
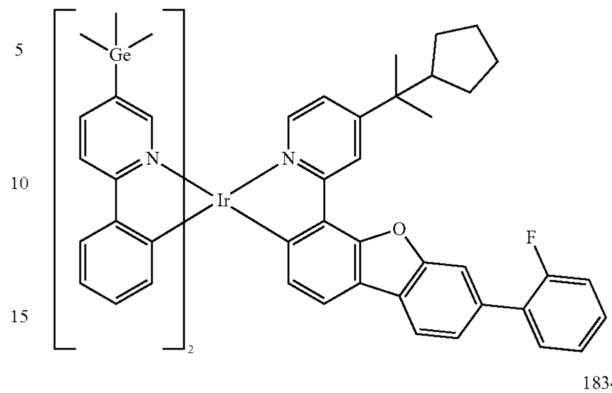
1834
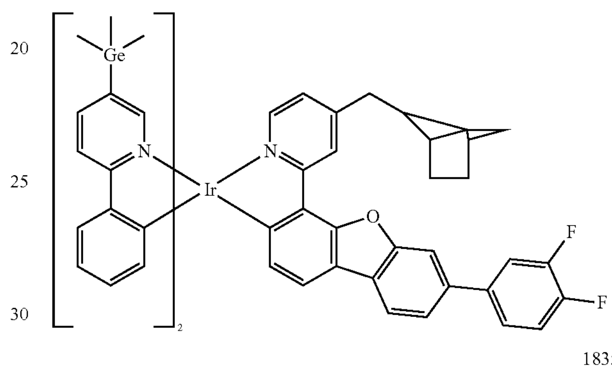
1835
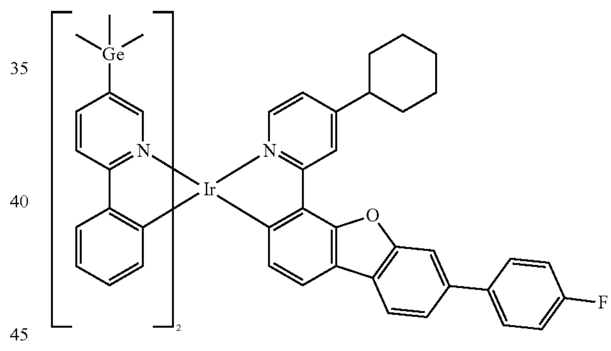
1836
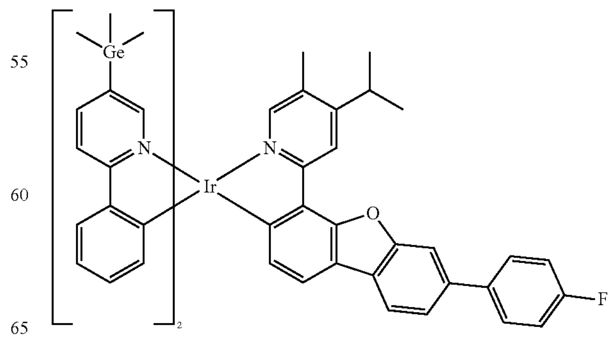

-continued
1837
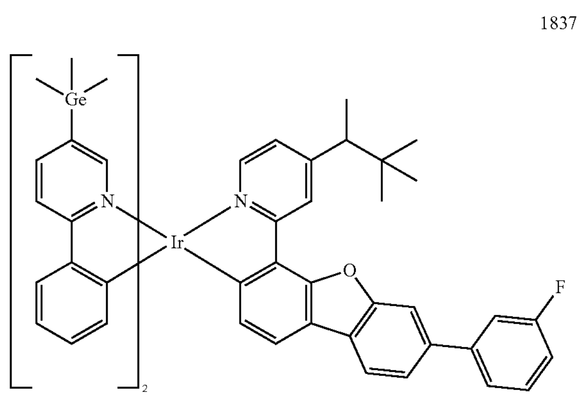
1838
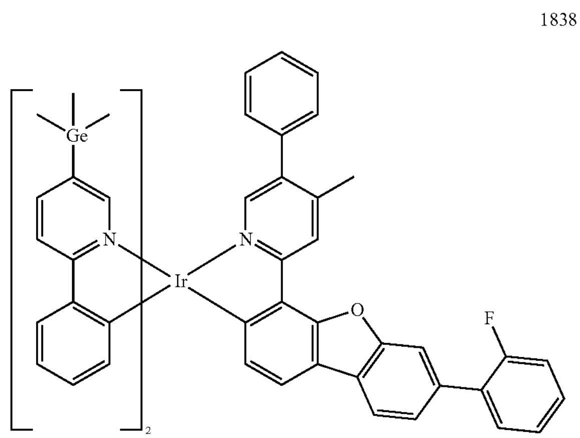
1839
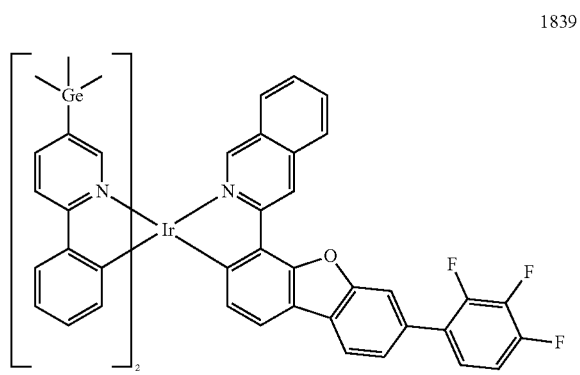
1840
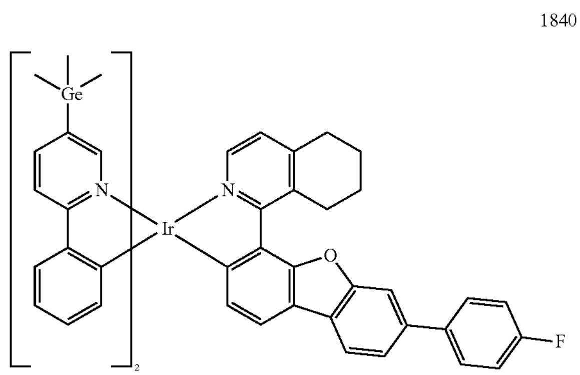
-continued
1841
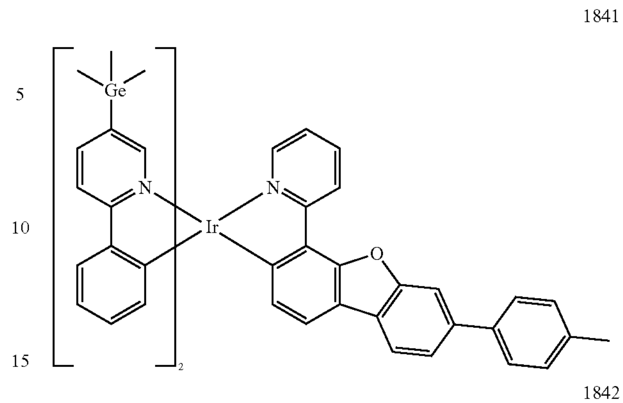
1842
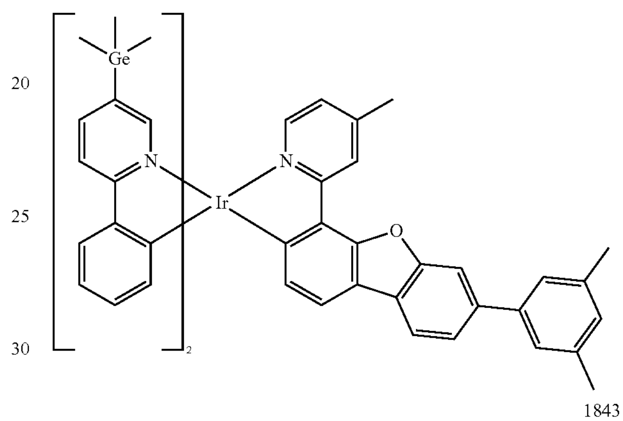
1843
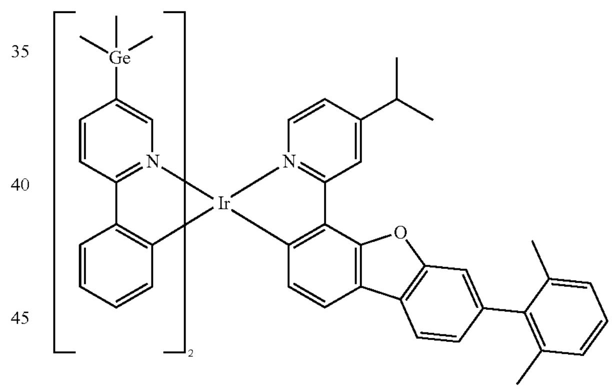
1844
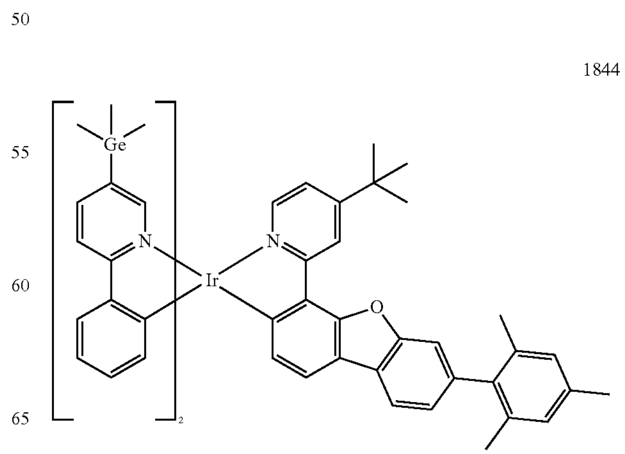

-continued
1845
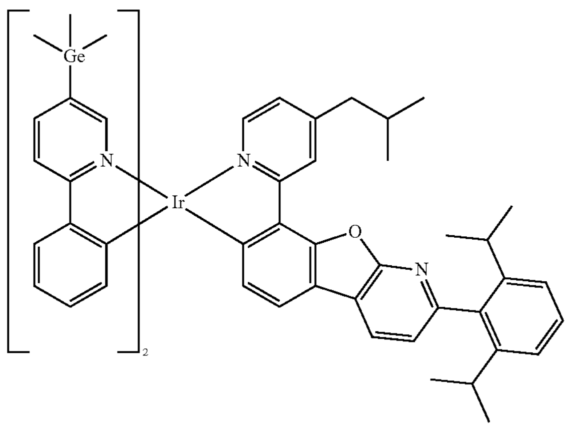
1846
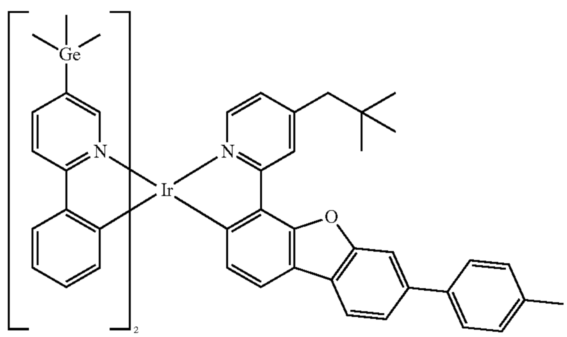
1847
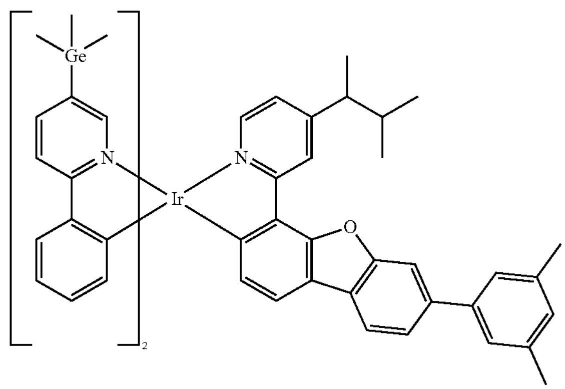
1848
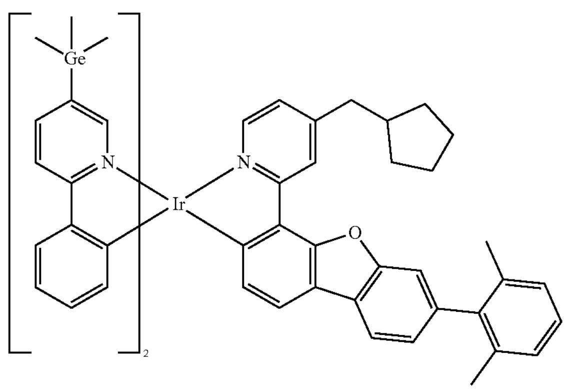
-continued
1849
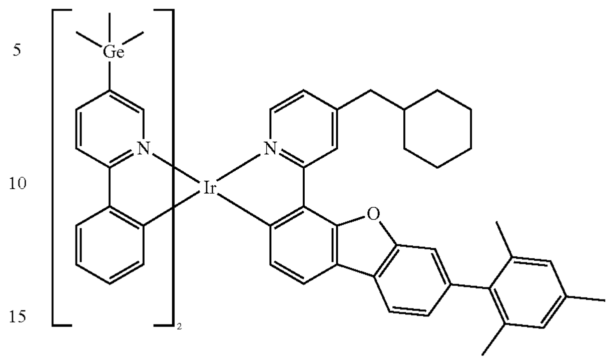
1850
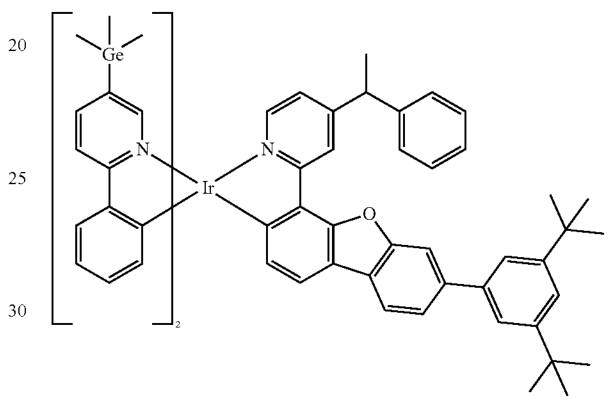
1851
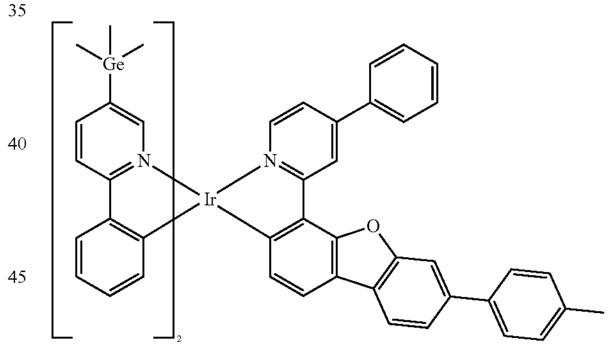
1852
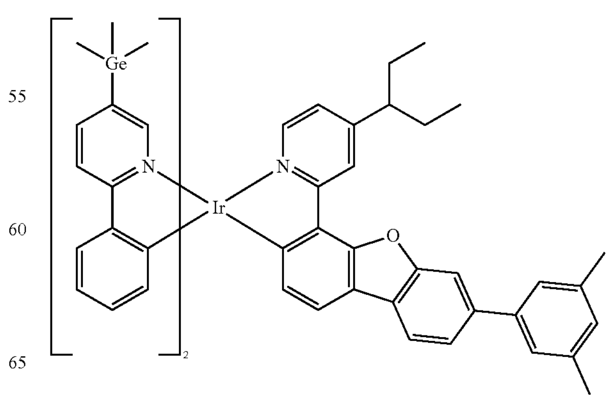

-continued
1853
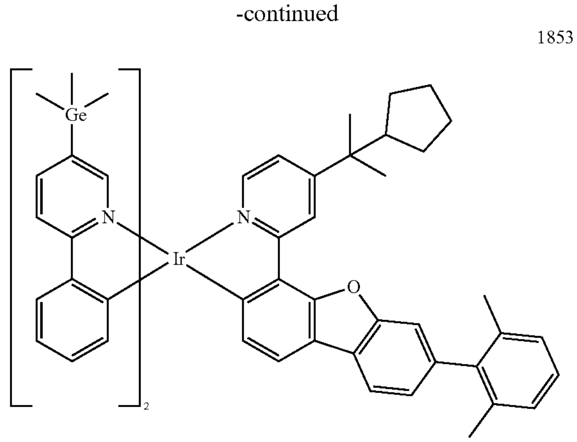
1854
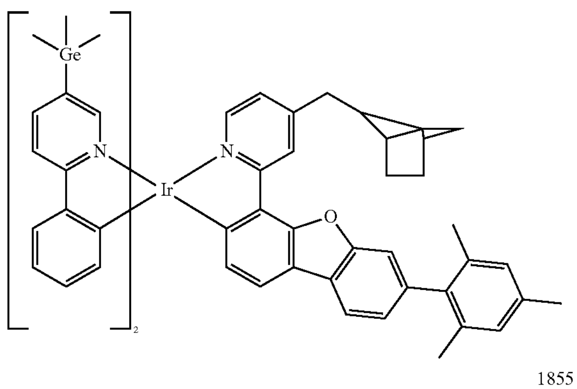
1855
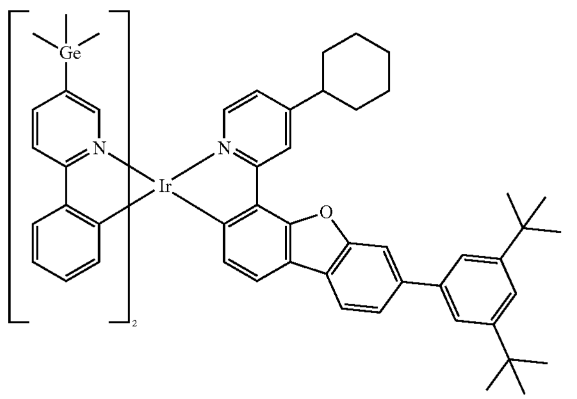
1856
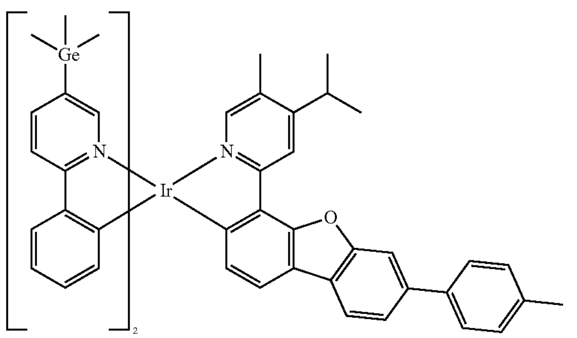
-continued
1857
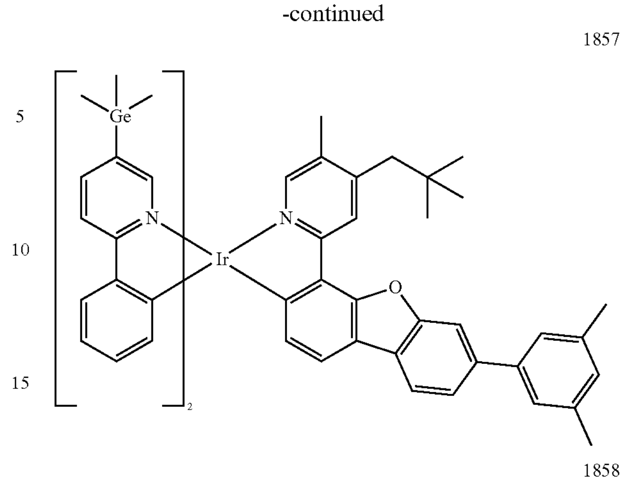
1858
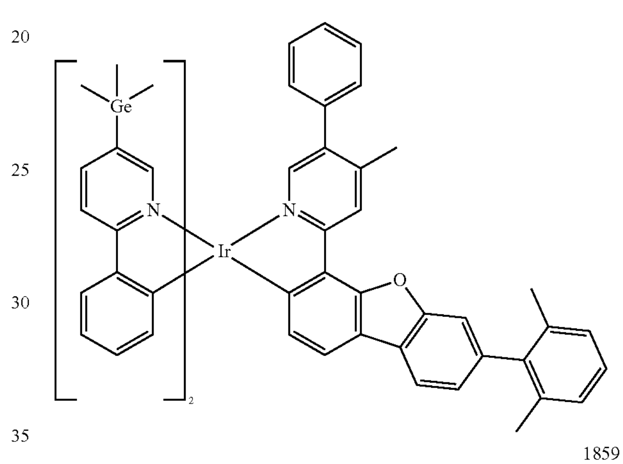
1859
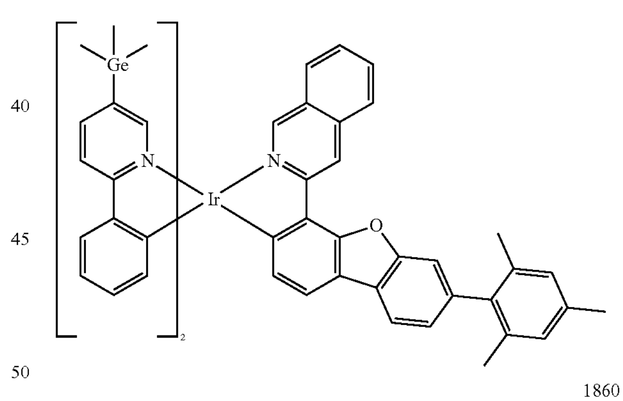
1860
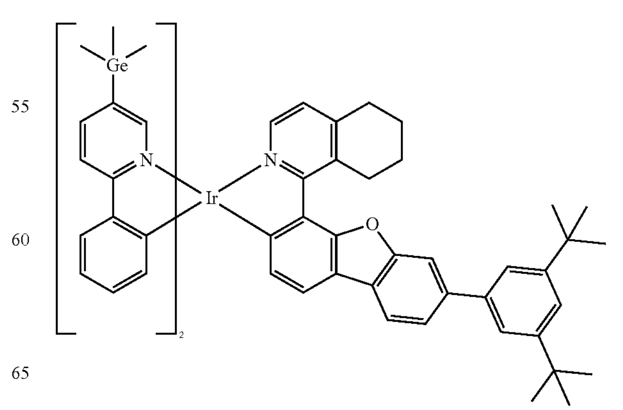

-continued
1861
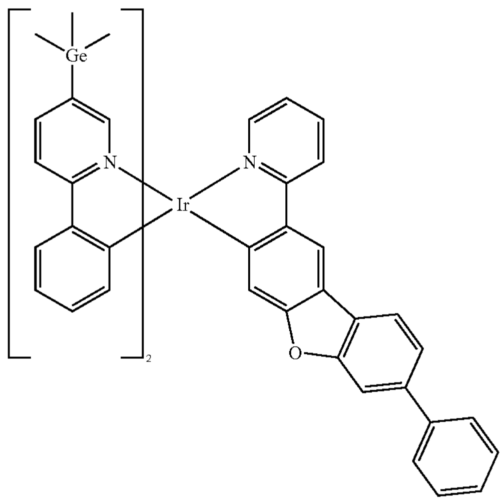
1862
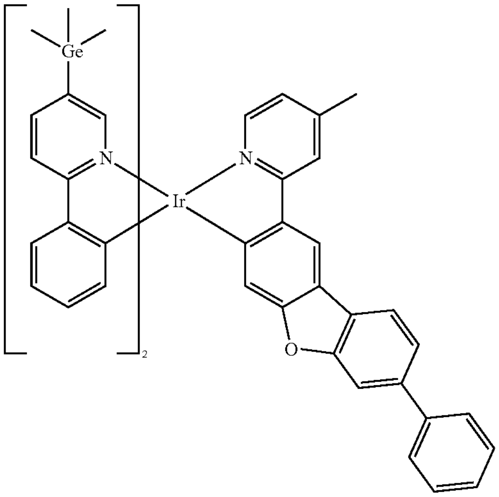
1863
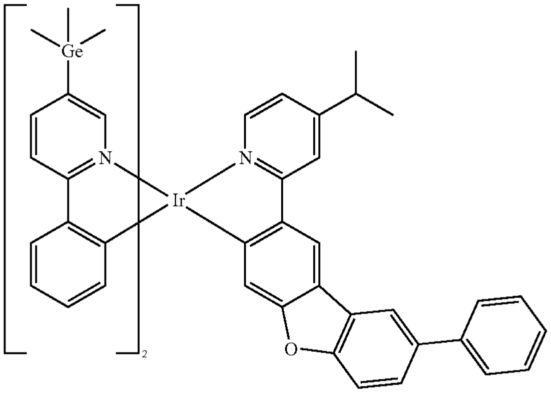
-continued
1864
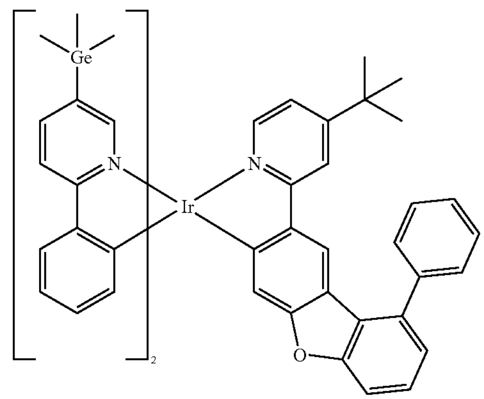
1865
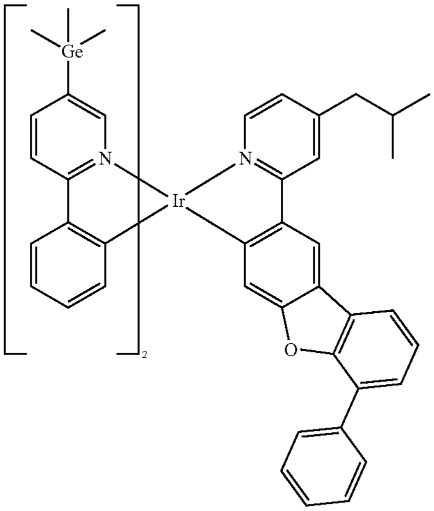
1866
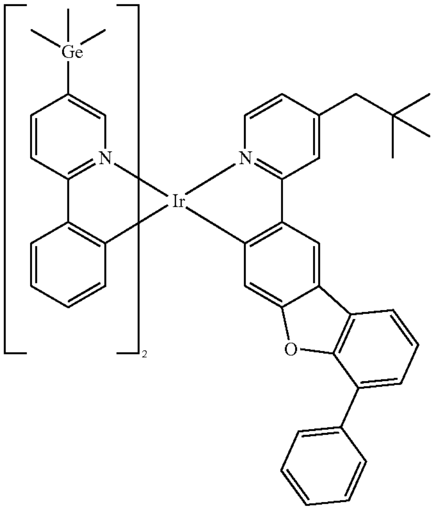

-continued
1867
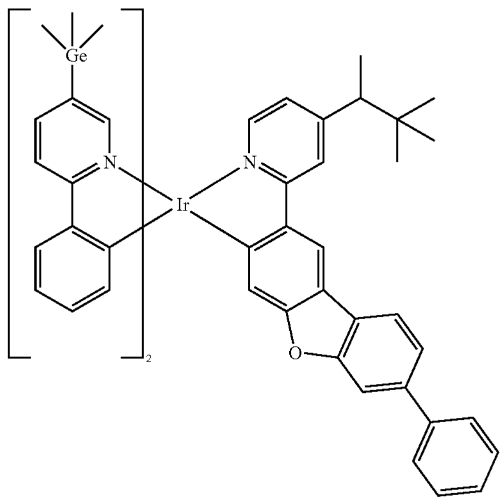
1868
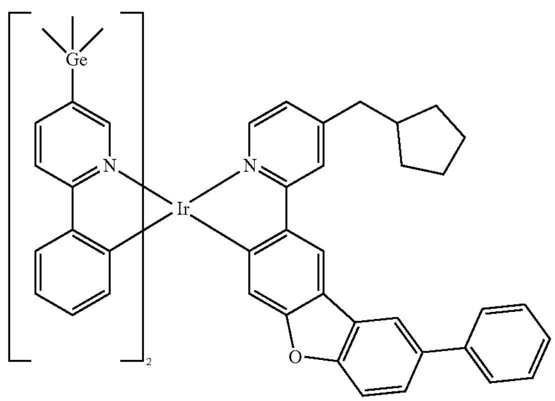
1869
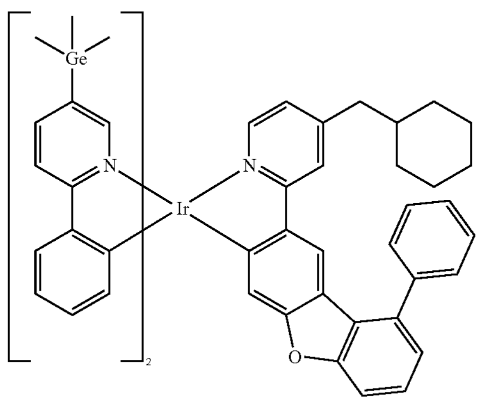
-continued
1870
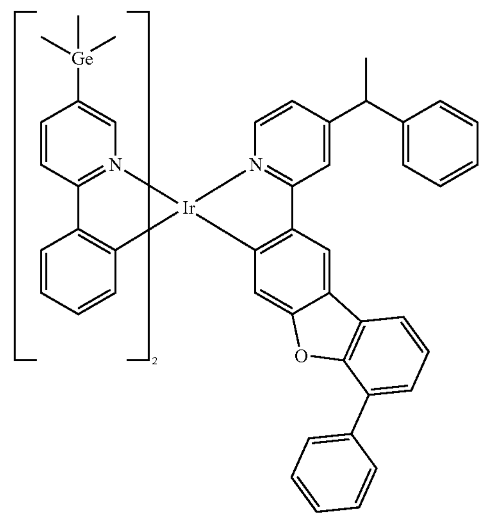
1871
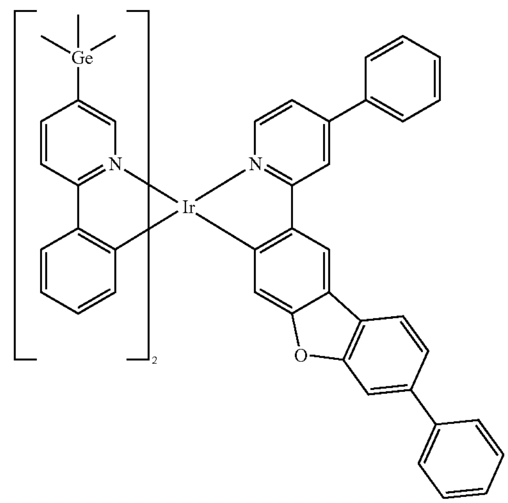
1872
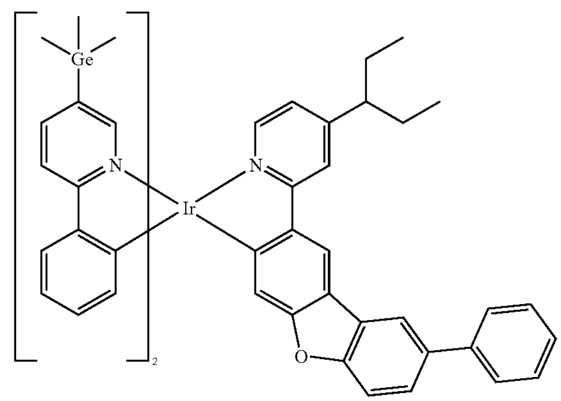

-continued
1873
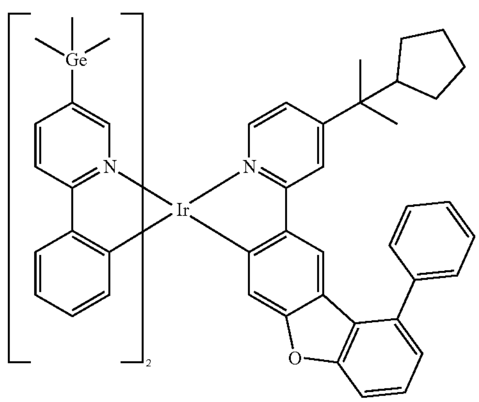
1874
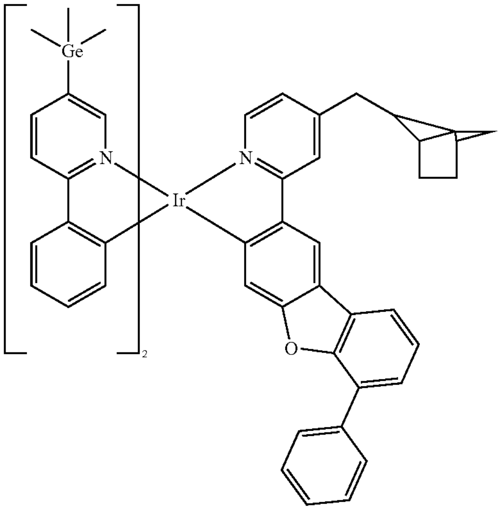
1875
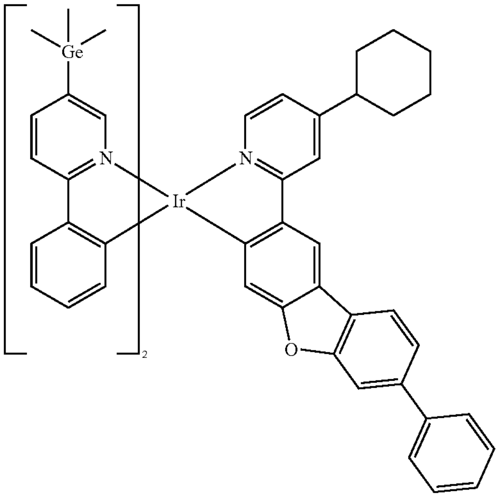
-continued
1876
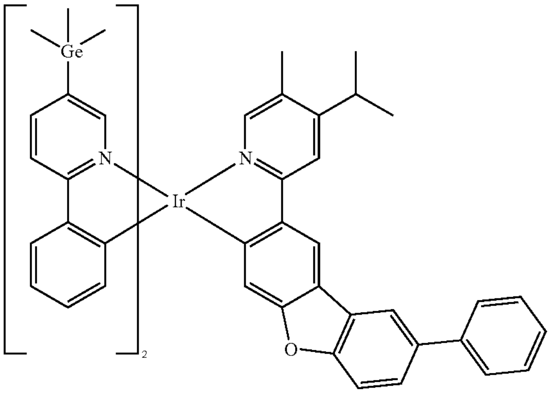
1877
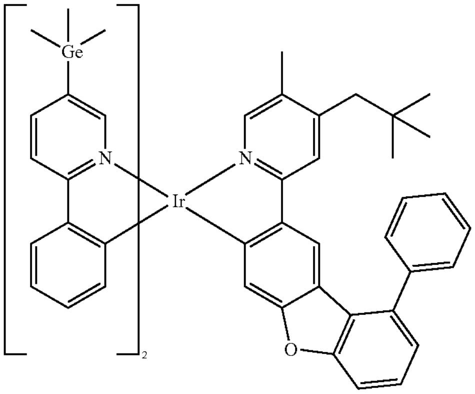
1878
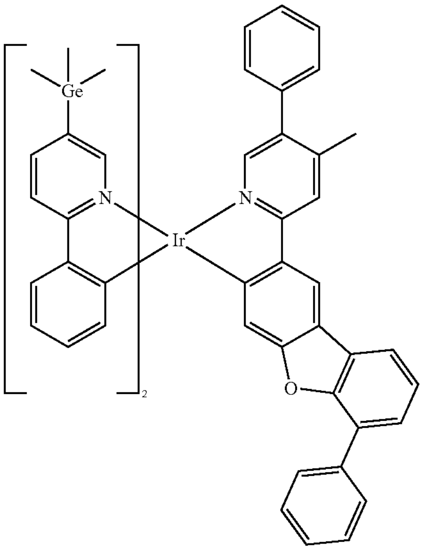

-continued
1879
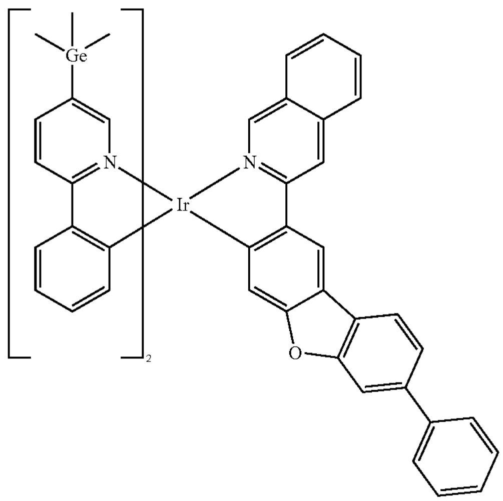
1880
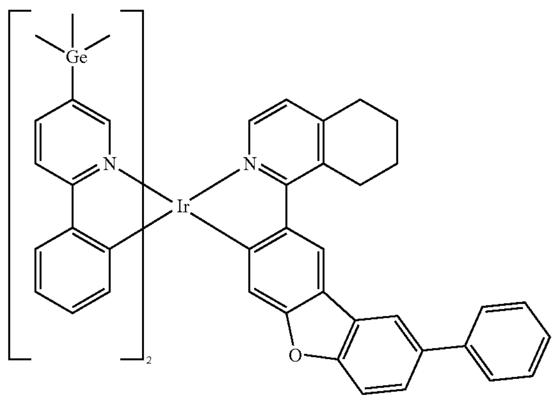
1881
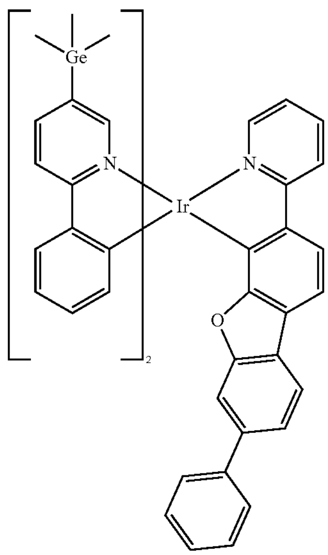
-continued
1882
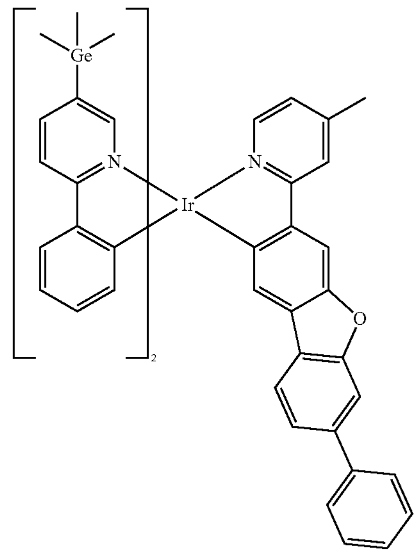
1883
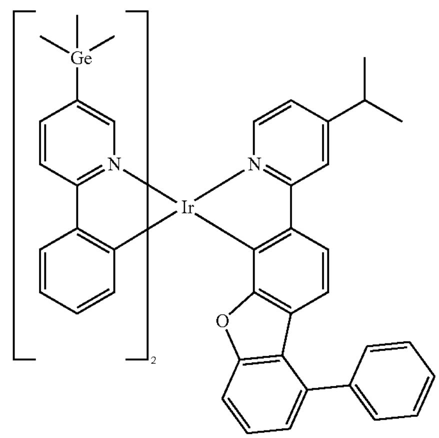
1884
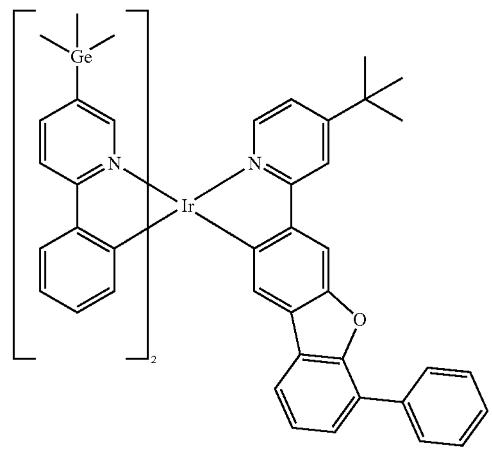

-continued
1885
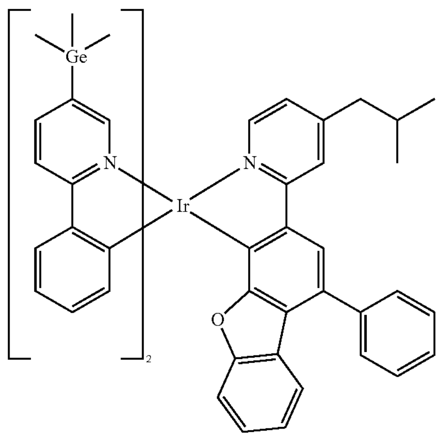
1886
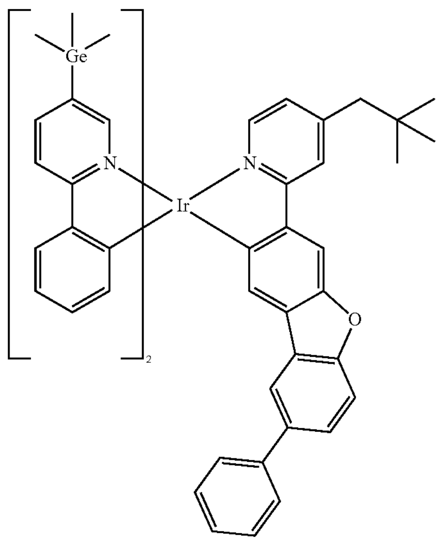
1887
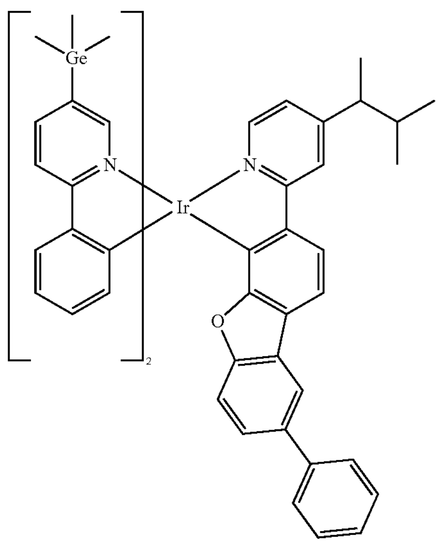
-continued
1888
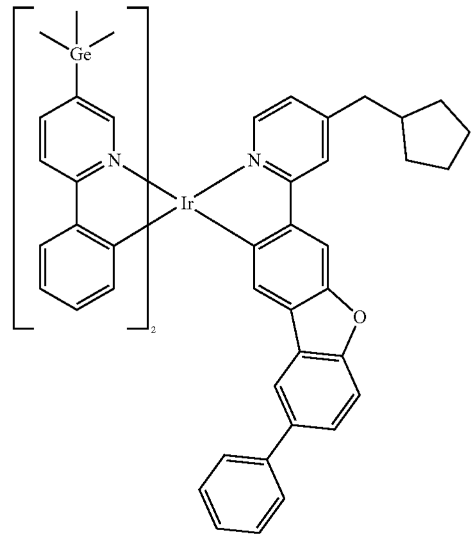
1889
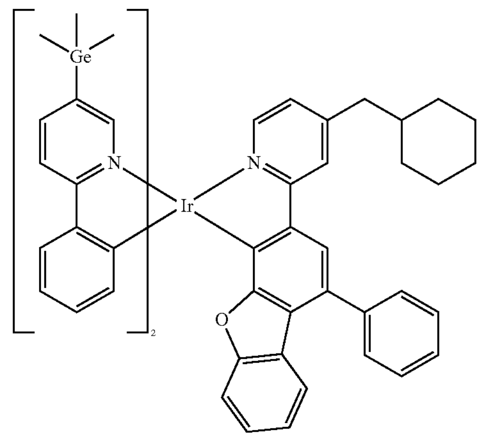
1890
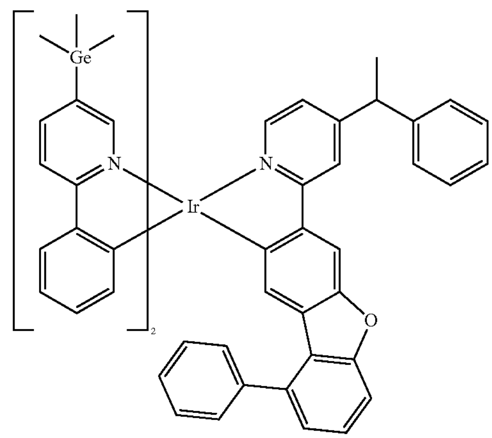

-continued
1891
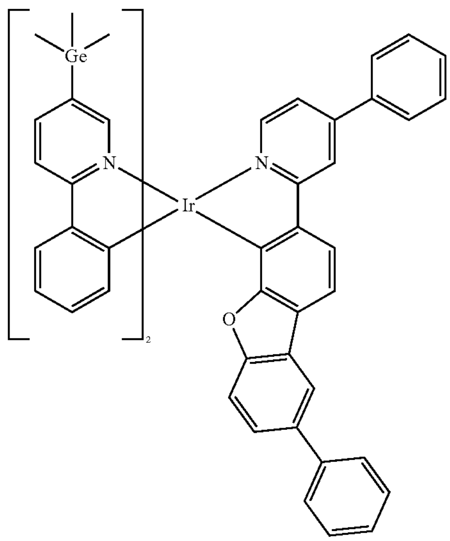
1892
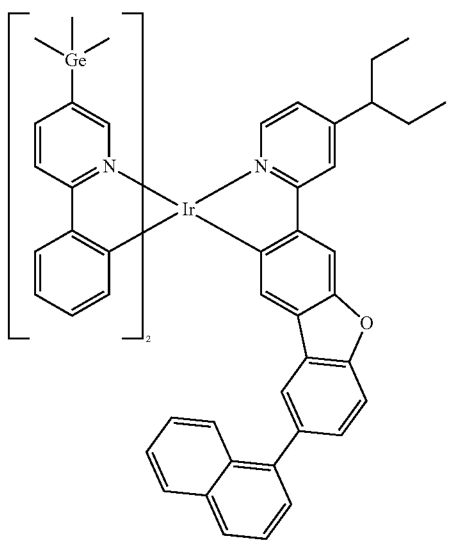
1893
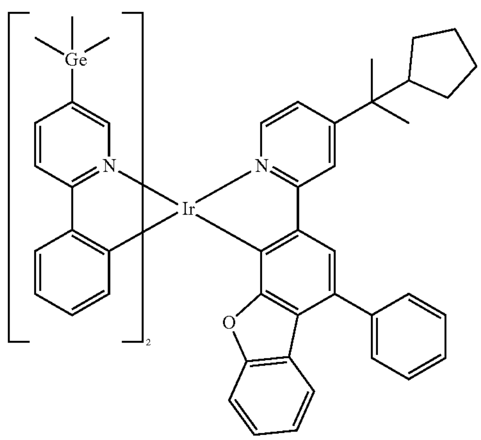
-continued
1894
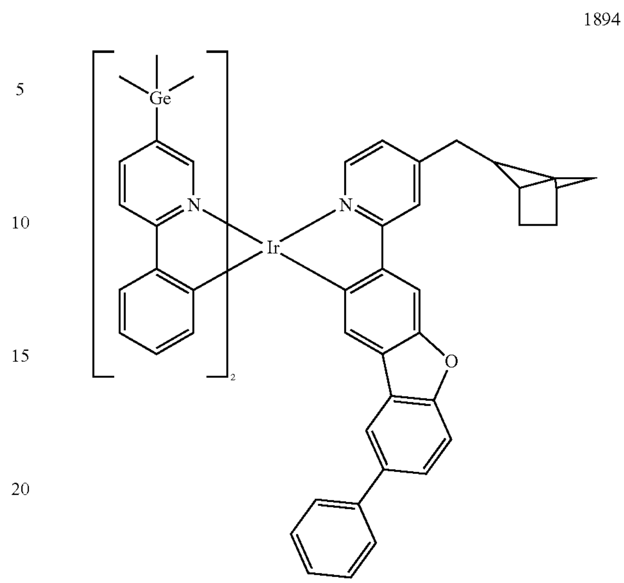
1895
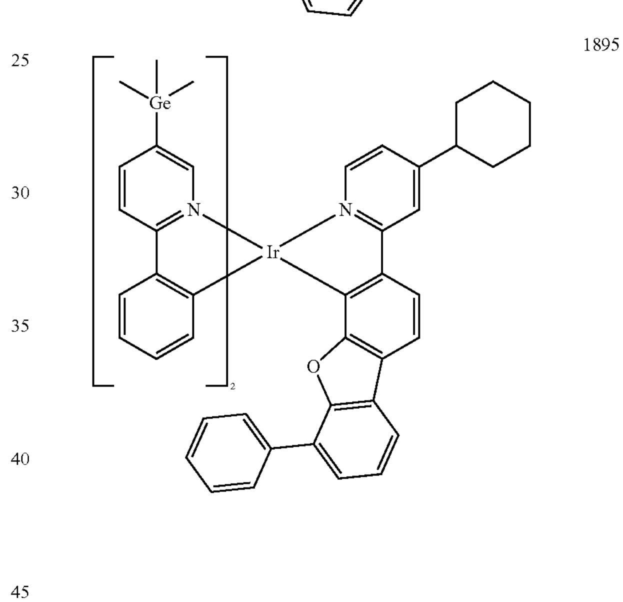
1896
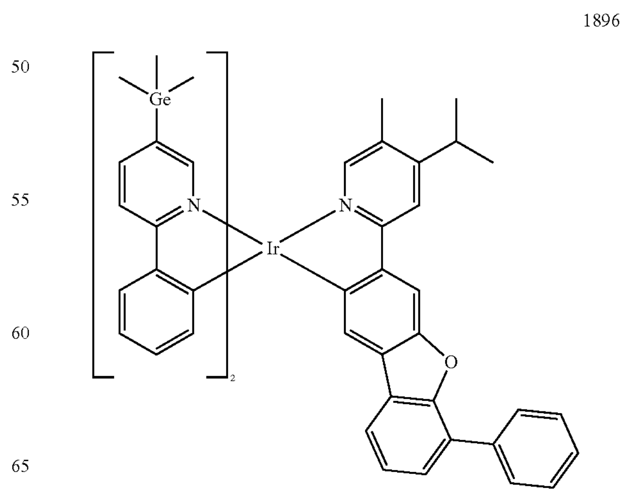

1897
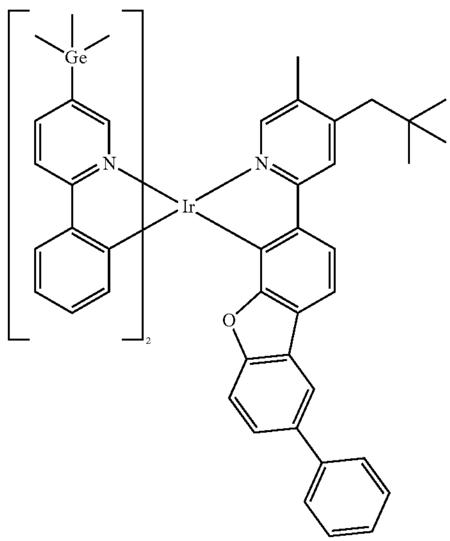
1898
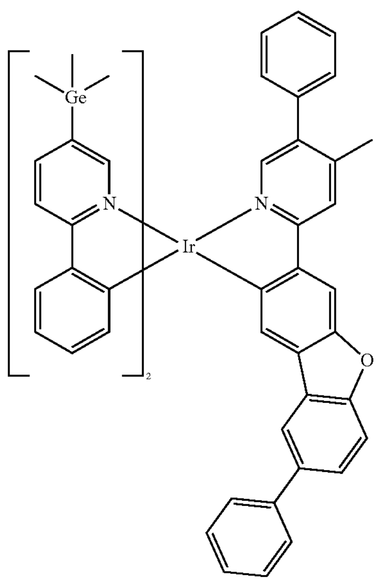
1899
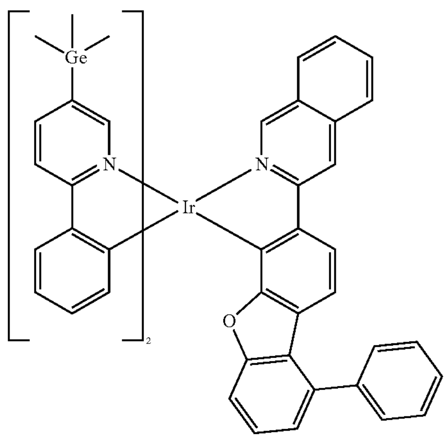
1900
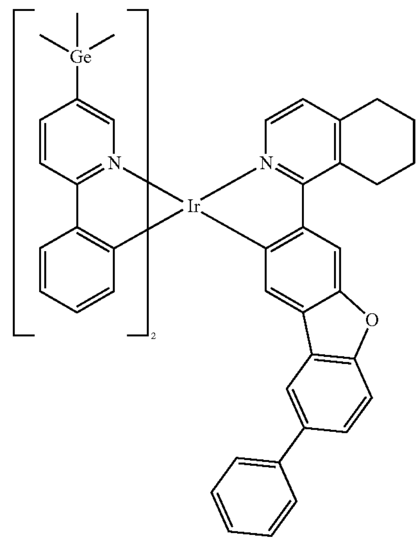
1901
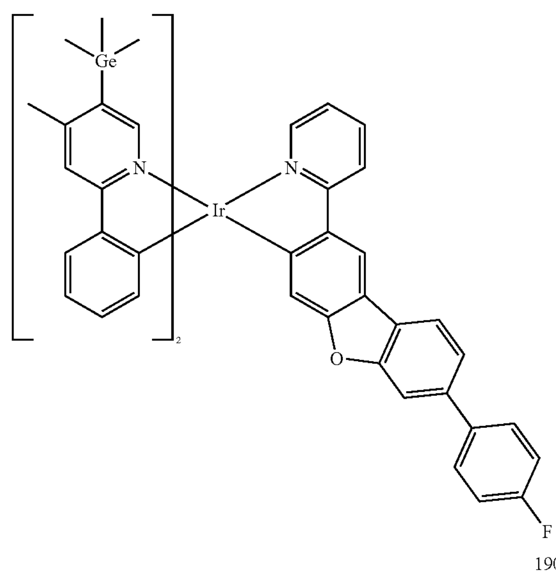
1902
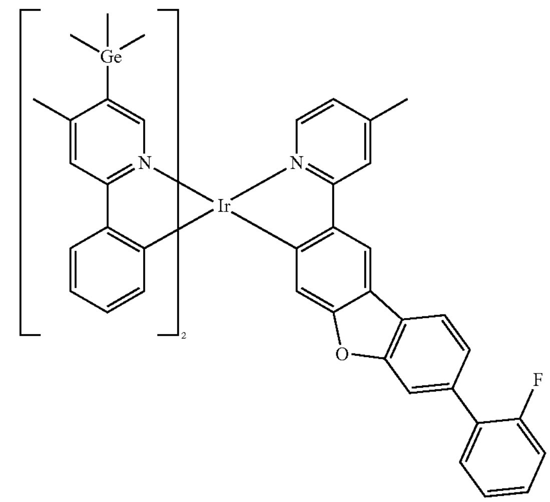

-continued
1903
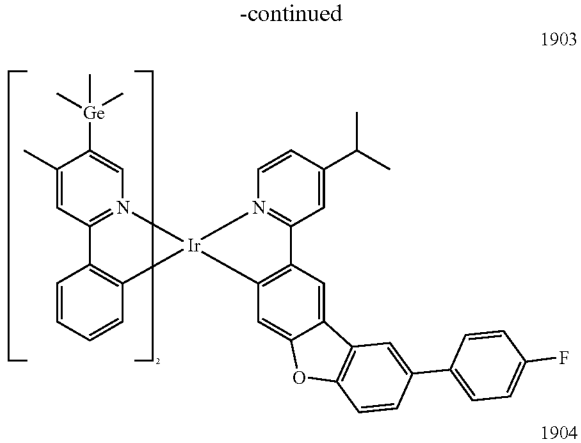
1904
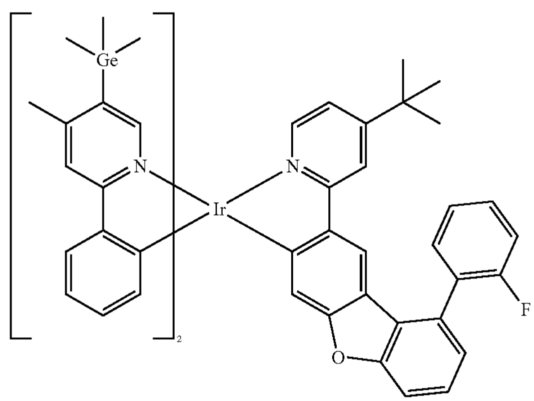
1905
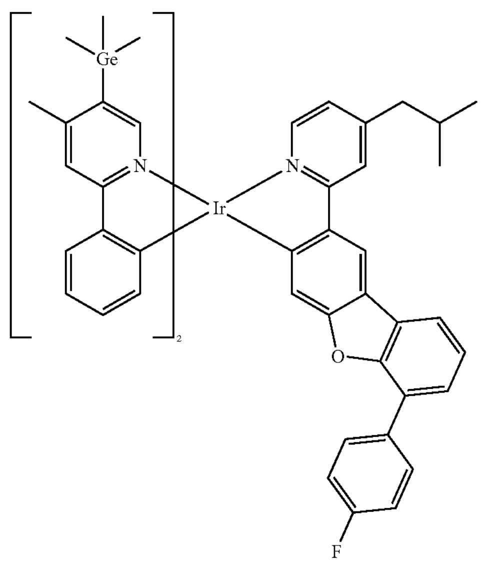
-continued
1906
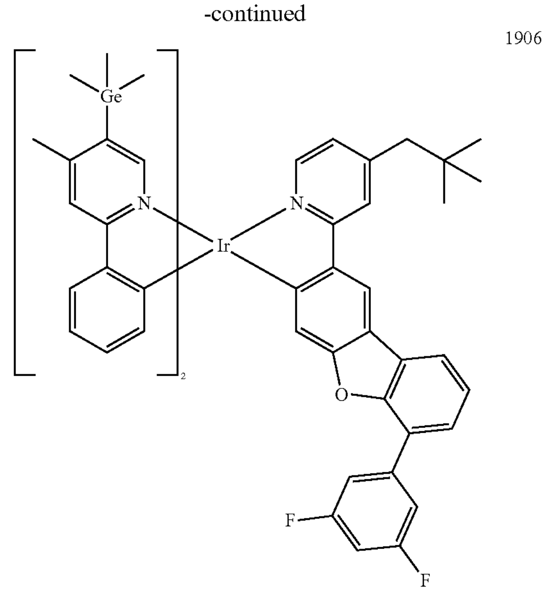
1907
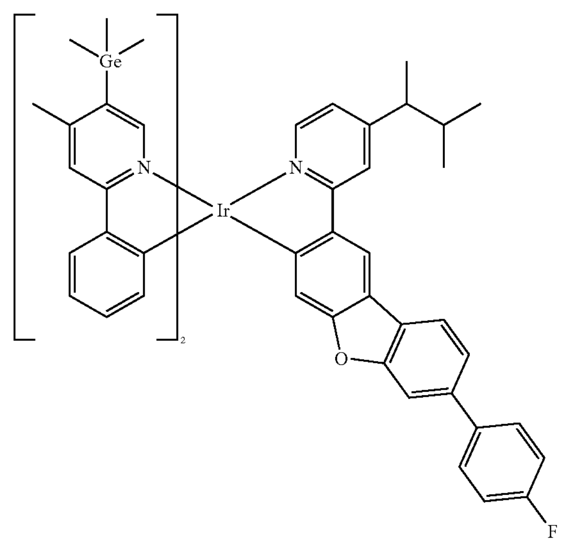
1908
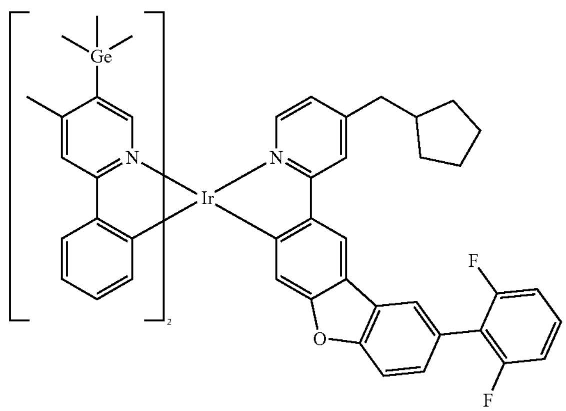

-continued
1909
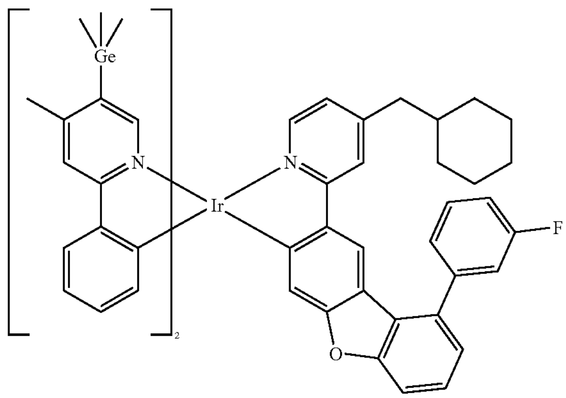
1910
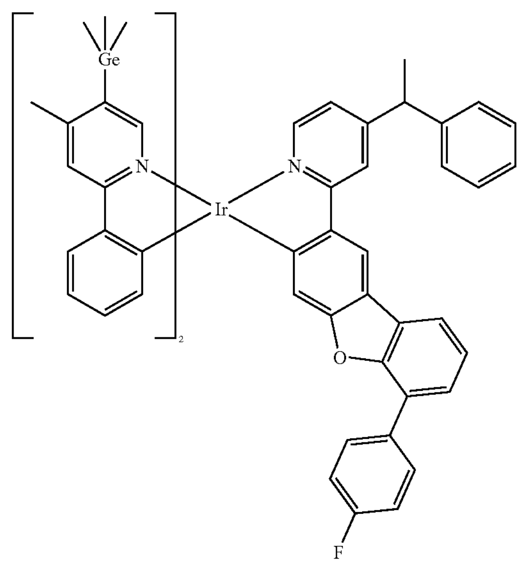
1911
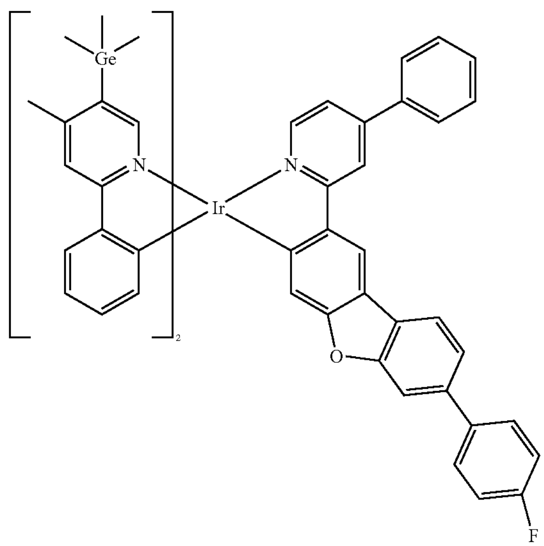
-continued
1912
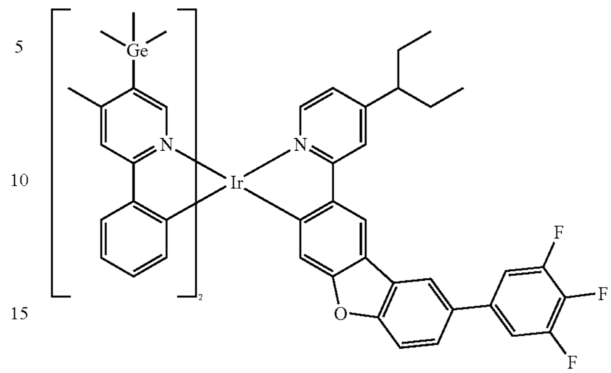
1913
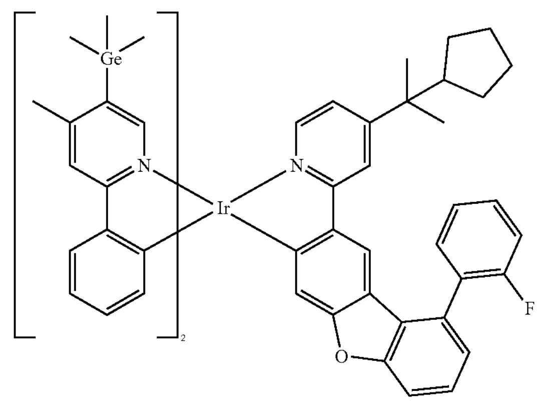
1914
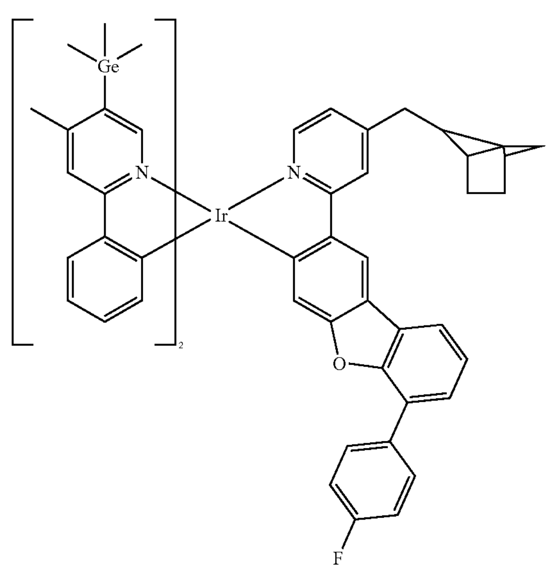

-continued
1915
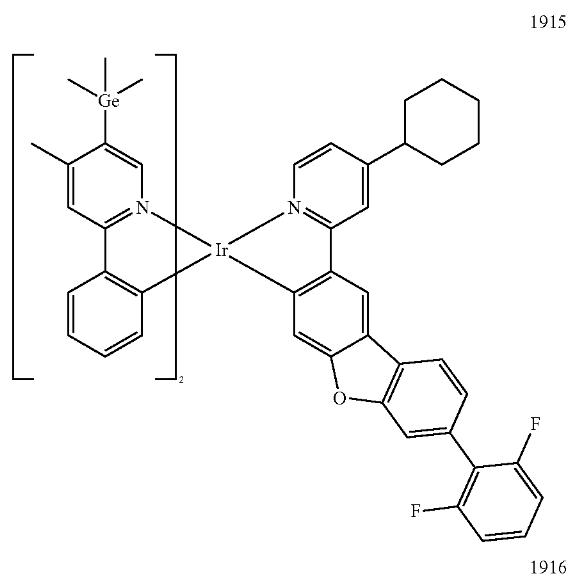
1916
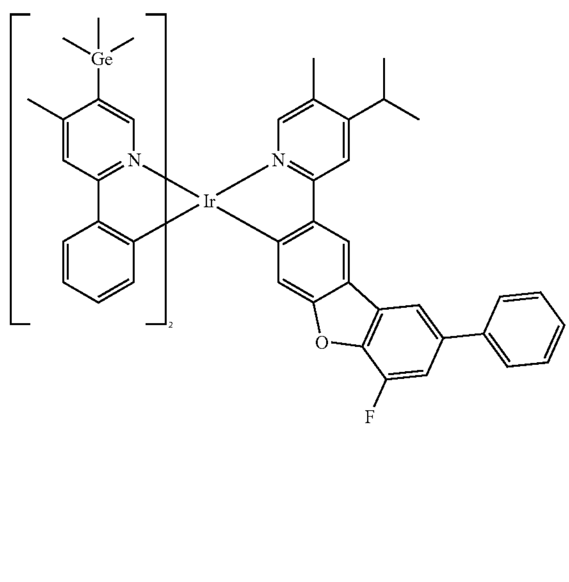
1917
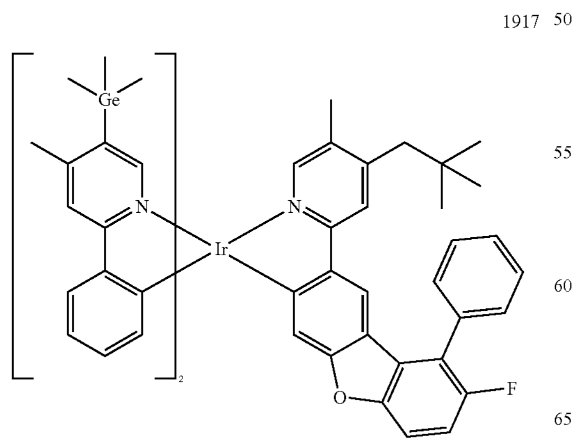
-continued
1918
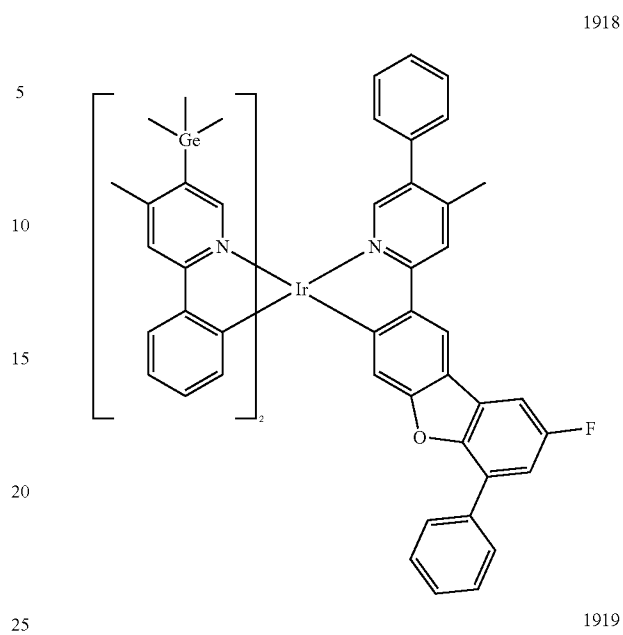
1919
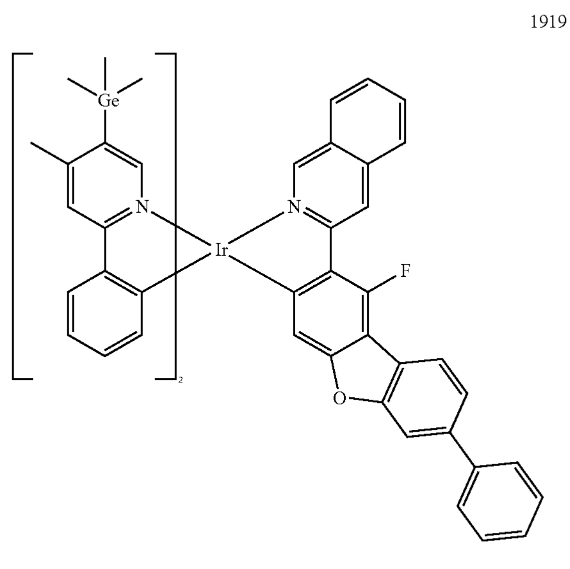
1920
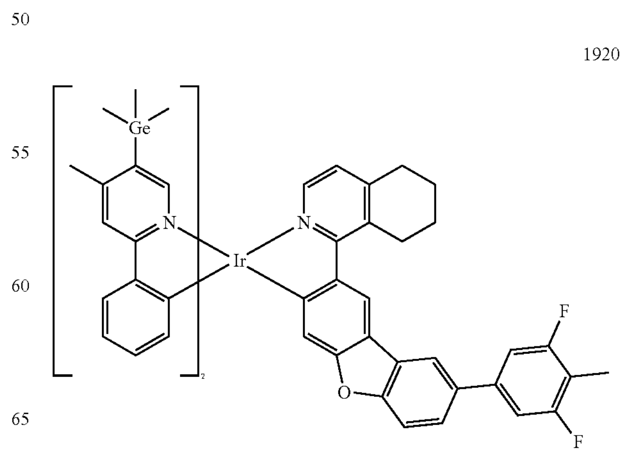

-continued
1921
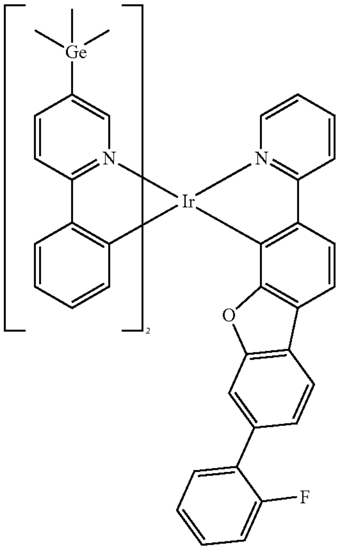
1922
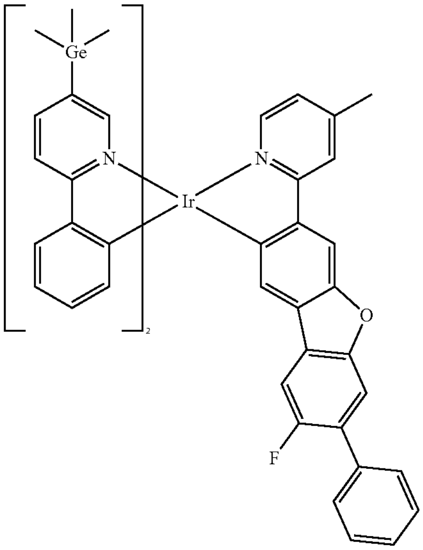
1923
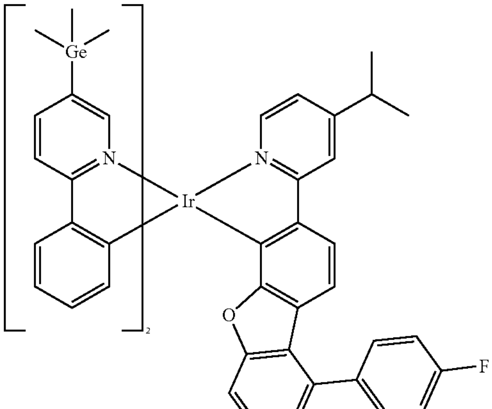
-continued
1924
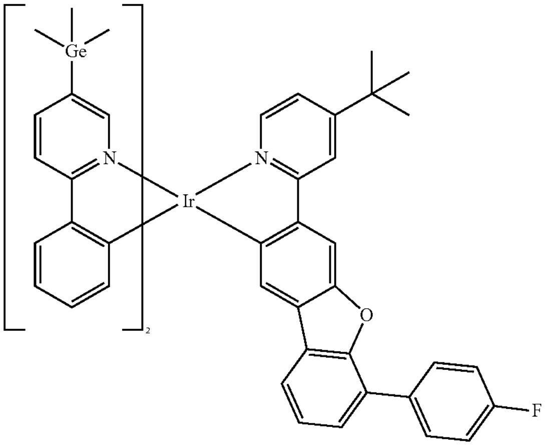
1925
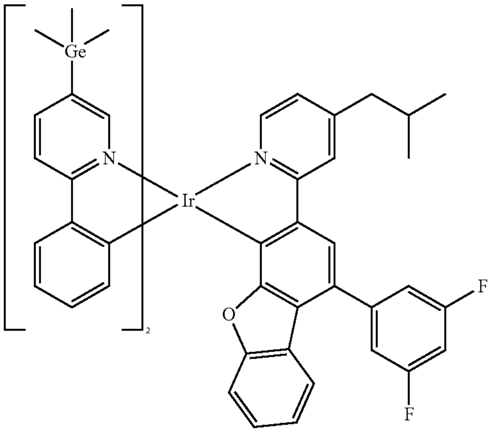
1926
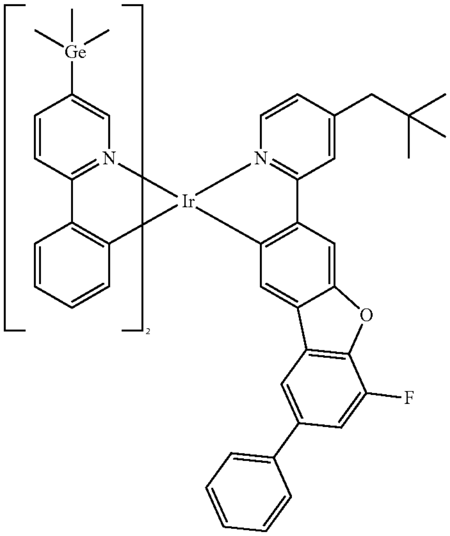

-continued
1927
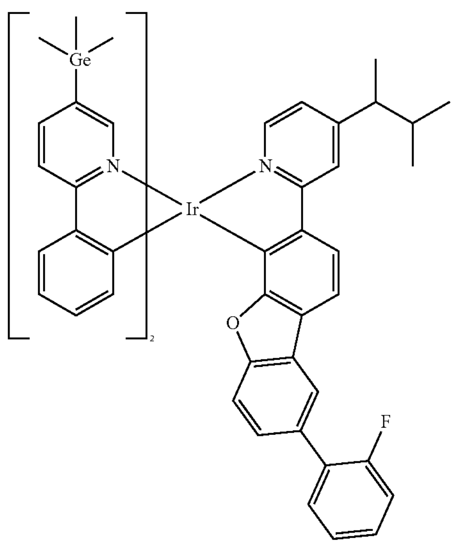
1928
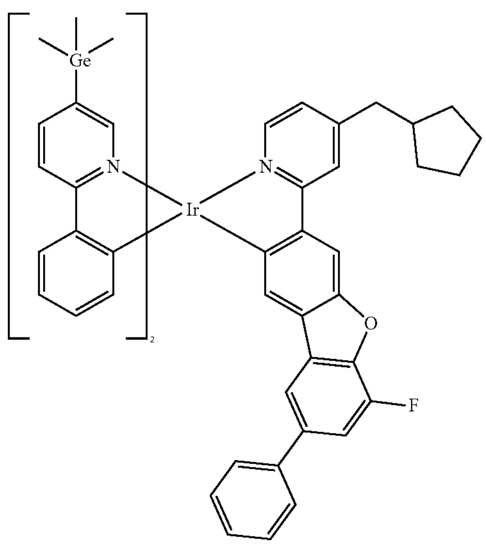
1929
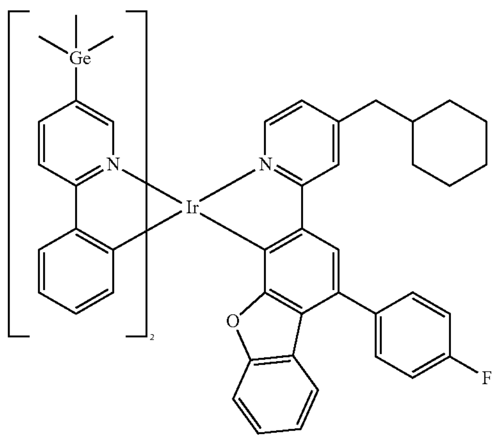
-continued
1930
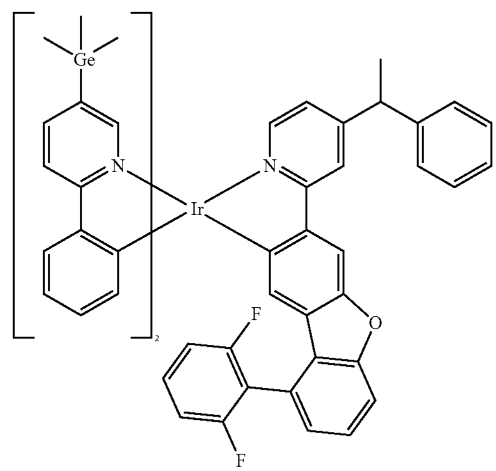
1931
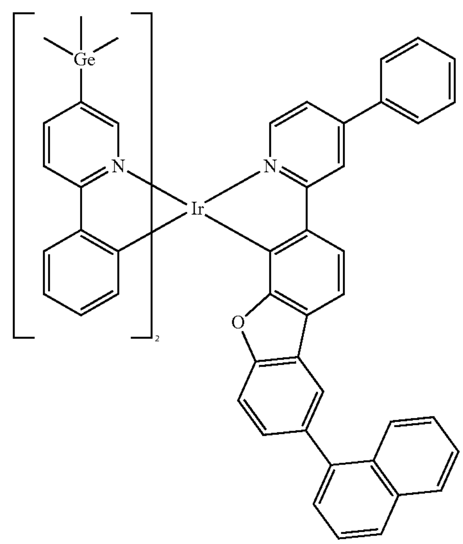
1932
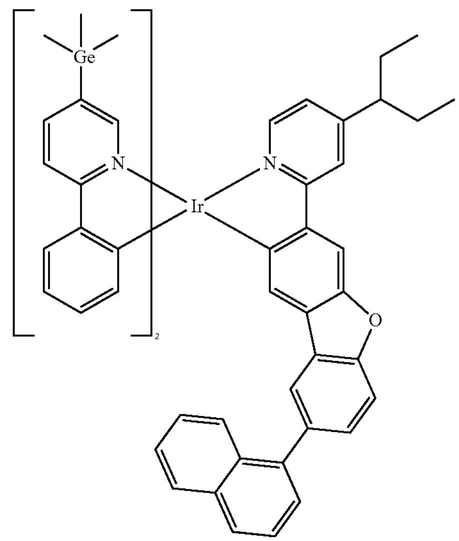

-continued
1933
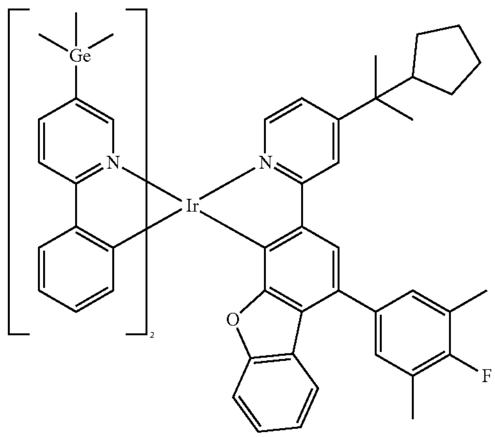
1934
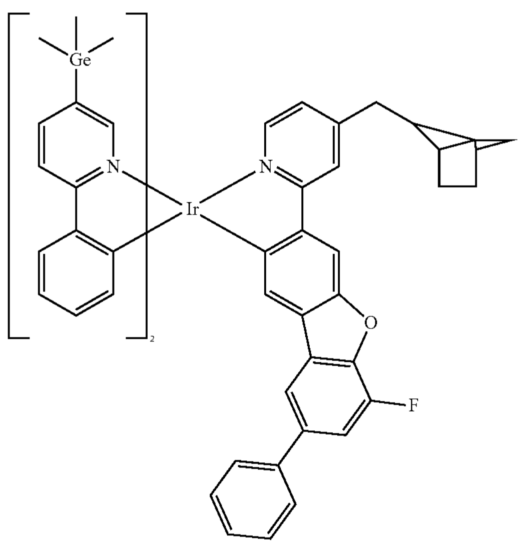
1935
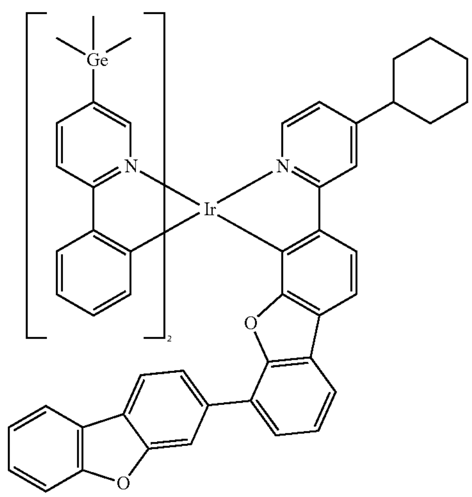
-continued
1936
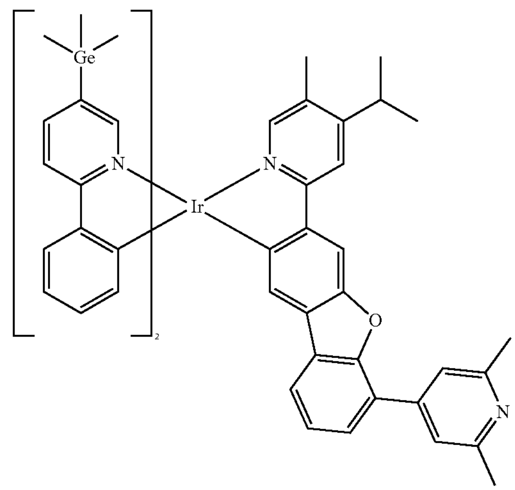
1937
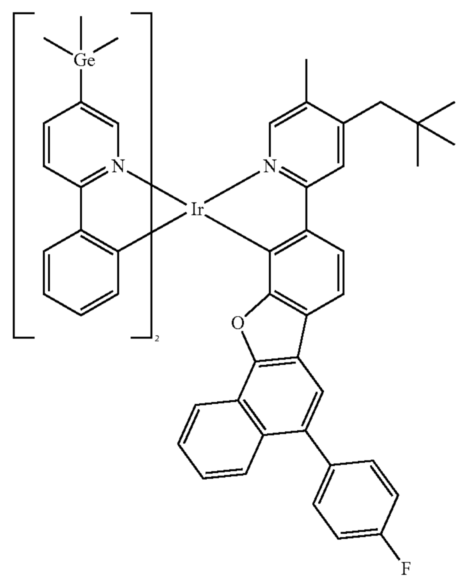
1938
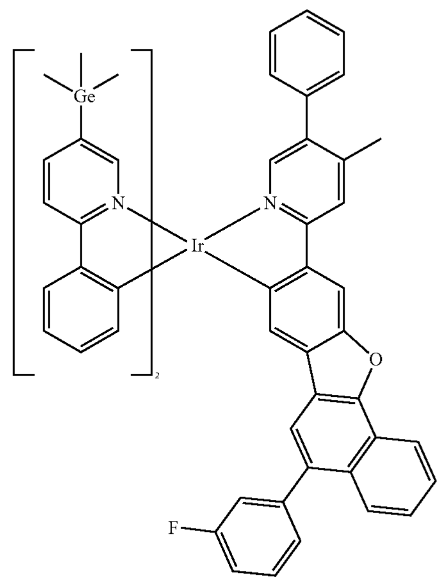

-continued
1939
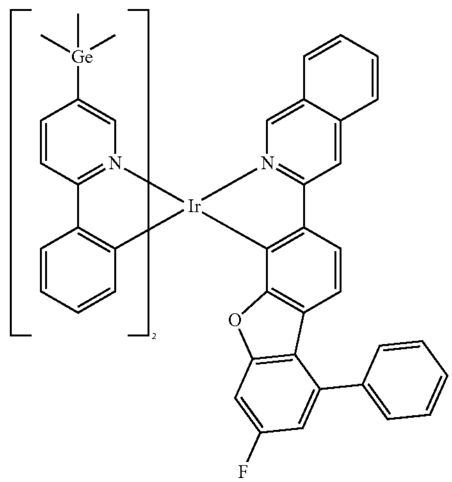
1940
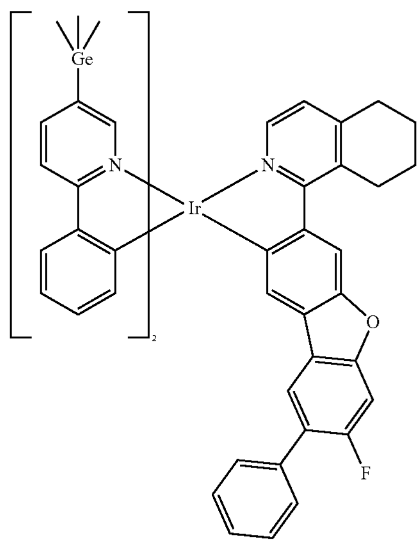
1941
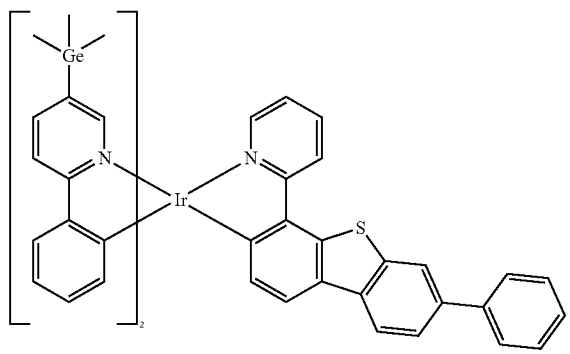
-continued
1942
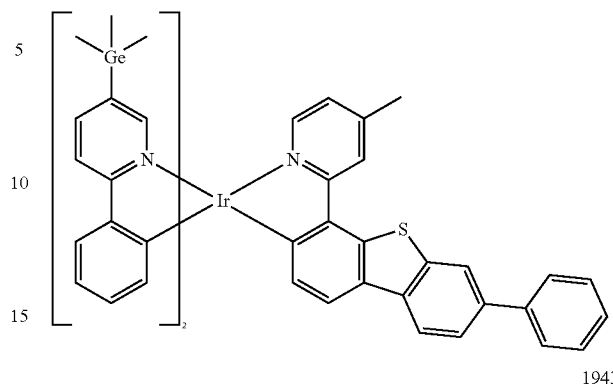
1943
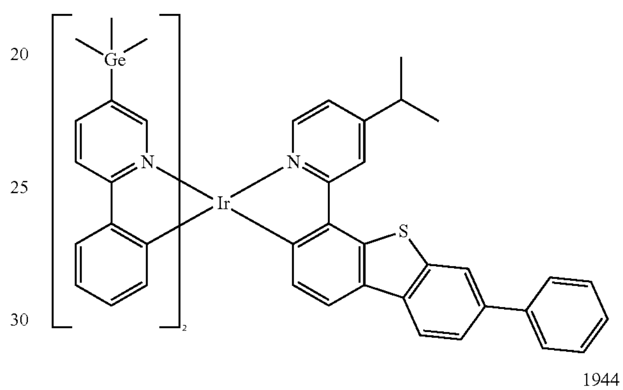
1944
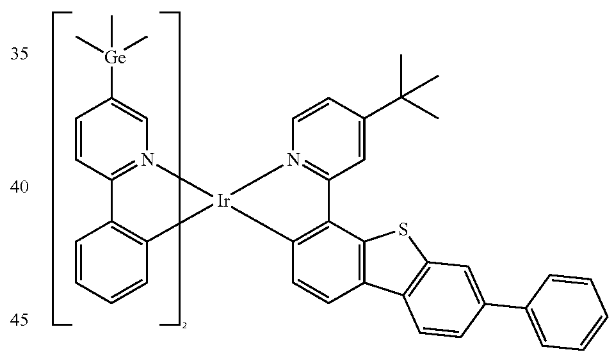
1945
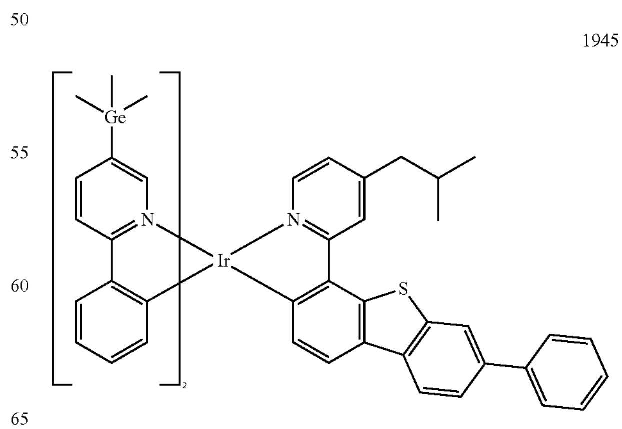

-continued
1946
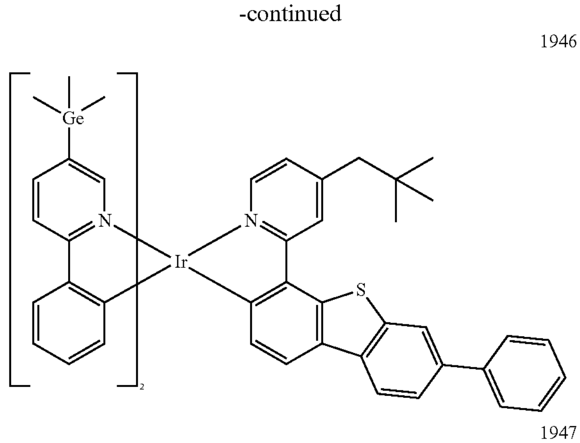
1947
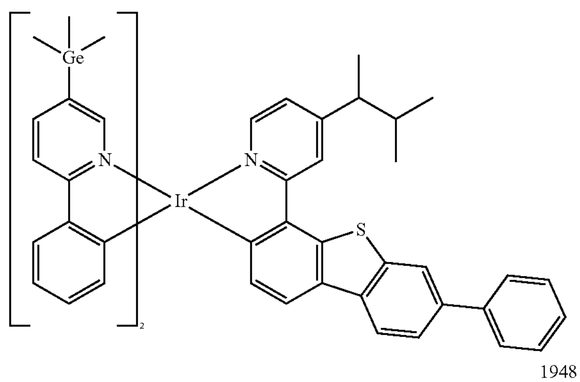
1948
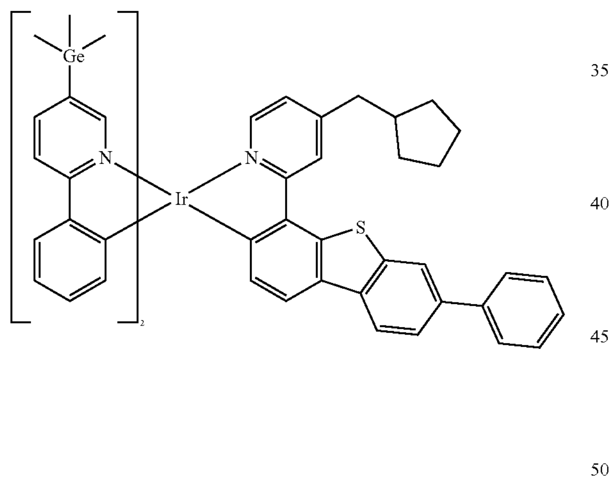
1949
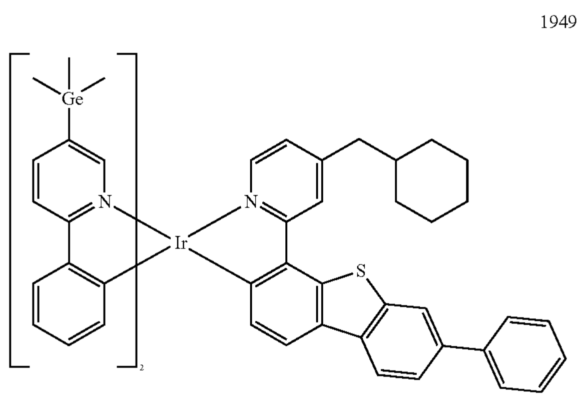
-continued
1950
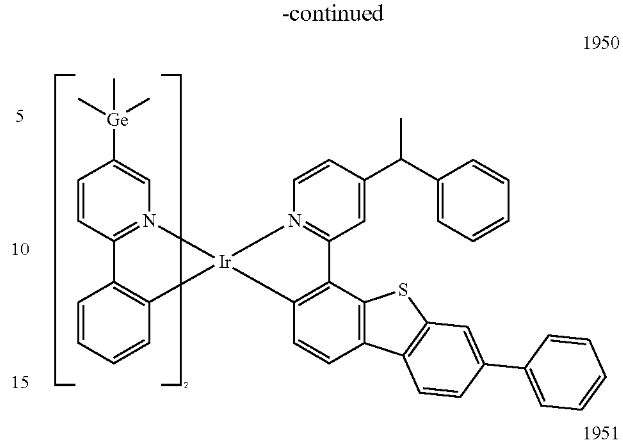
1951
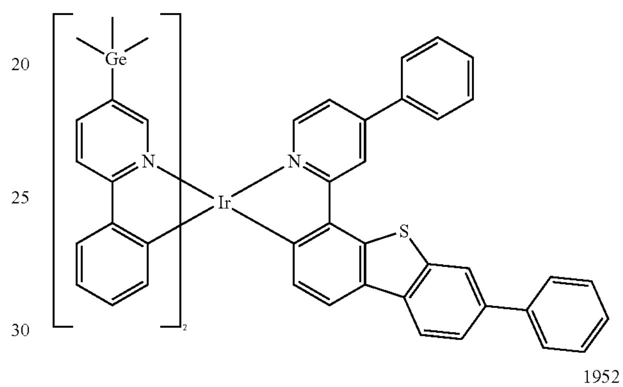
1952
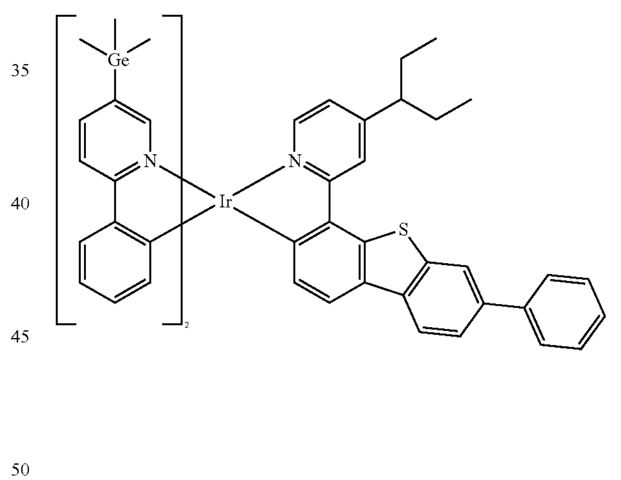
1953
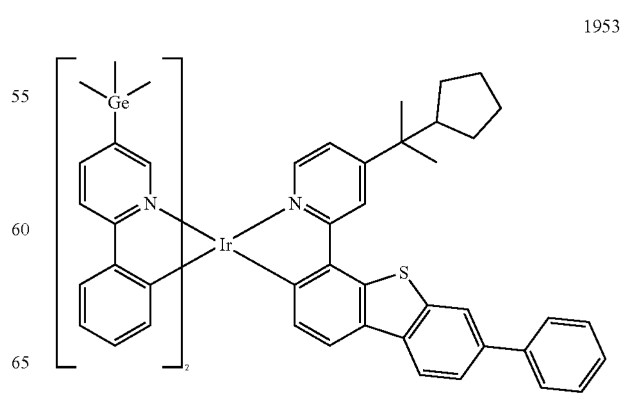

-continued
1954
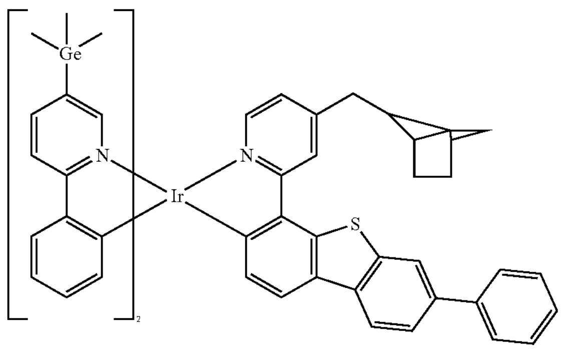
1955
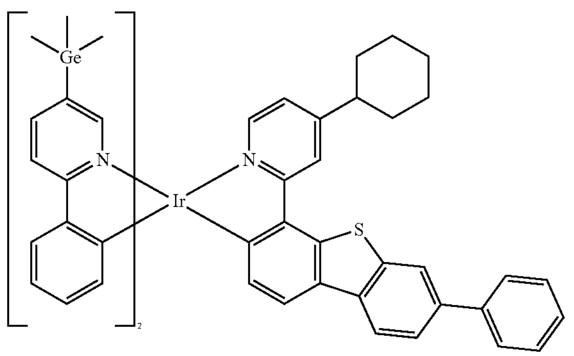
1956
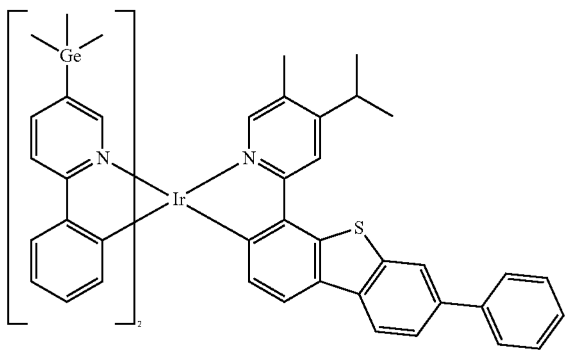
1957
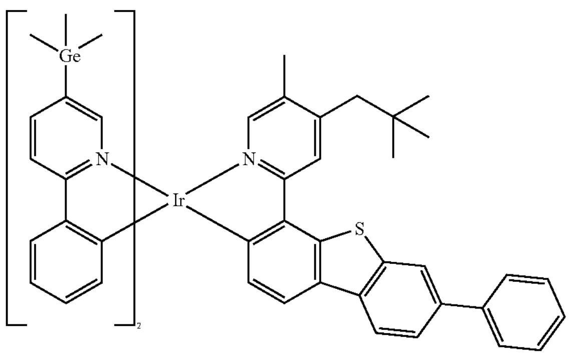
-continued
1958
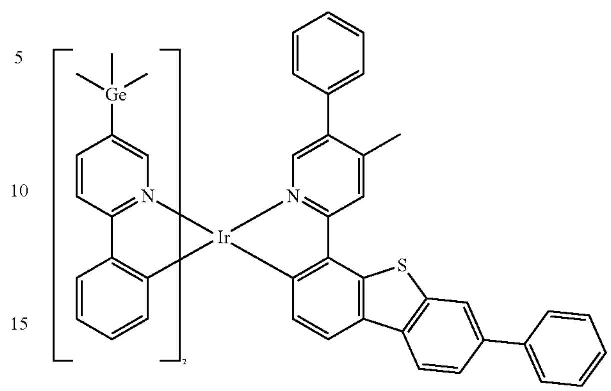
1959
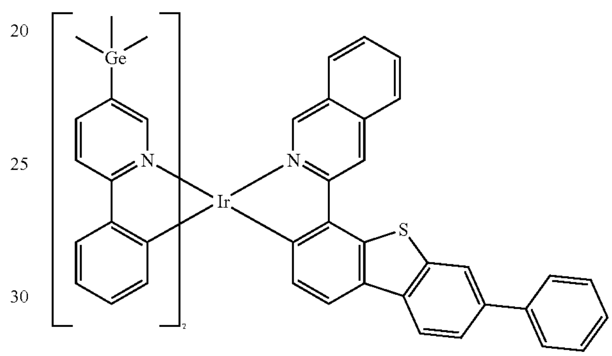
1960
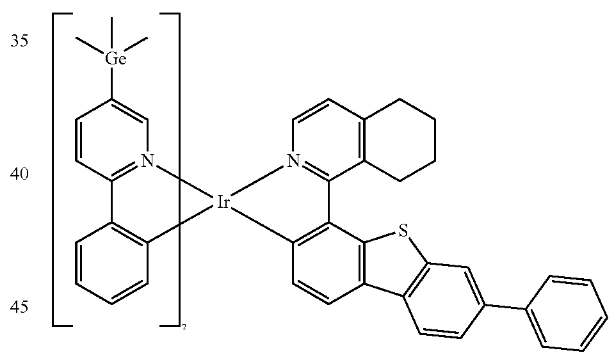
1961
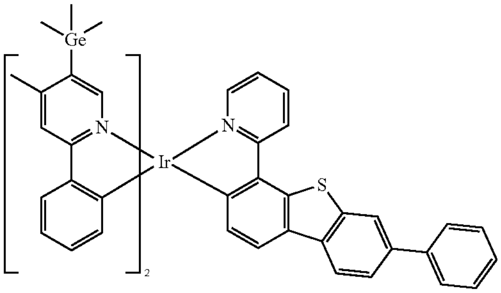

-continued
1962
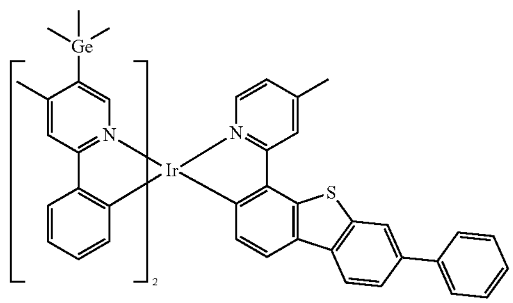
1963
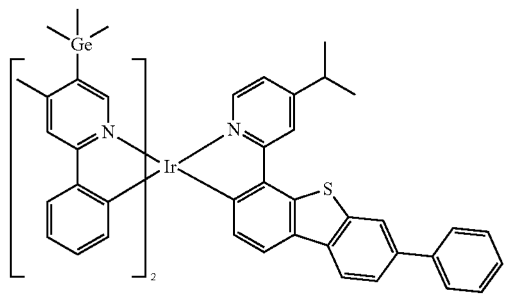
1964
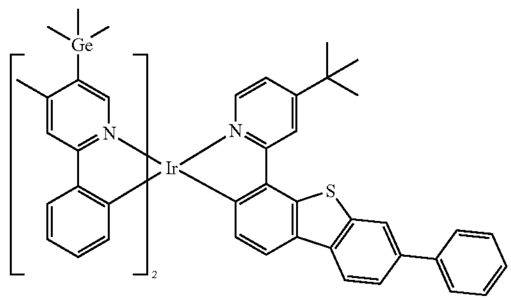
1965
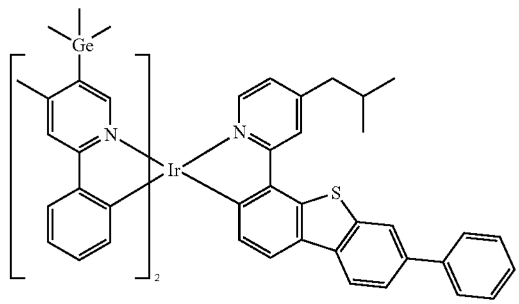
1966
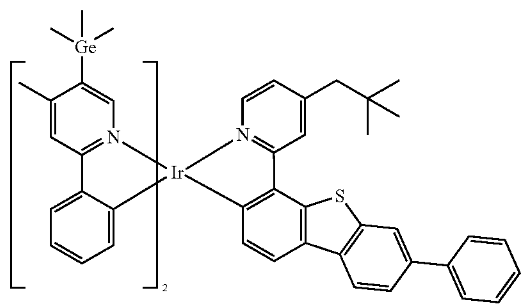
-continued
1967
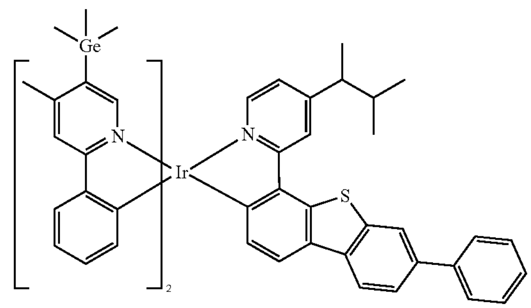
1968
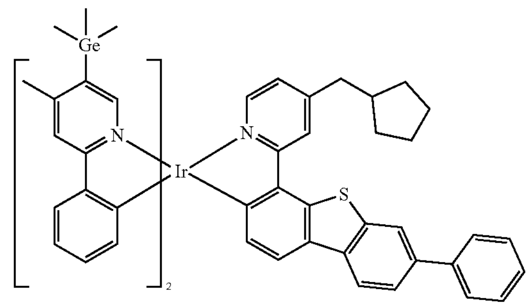
1969
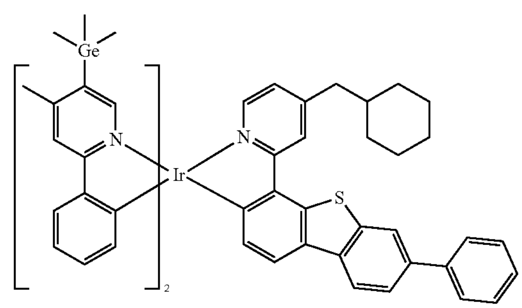
1970
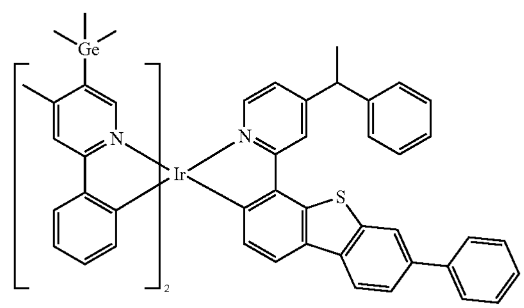
1971
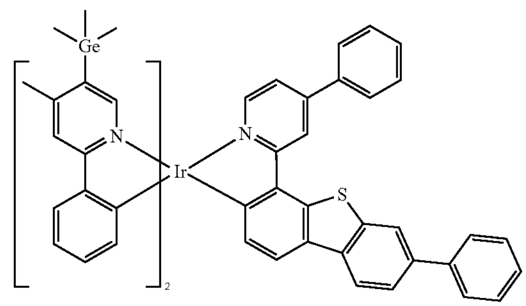

-continued
1972
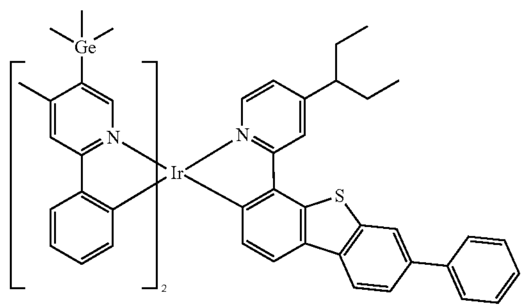
1973
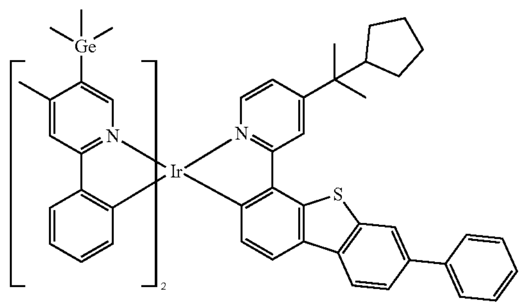
1974
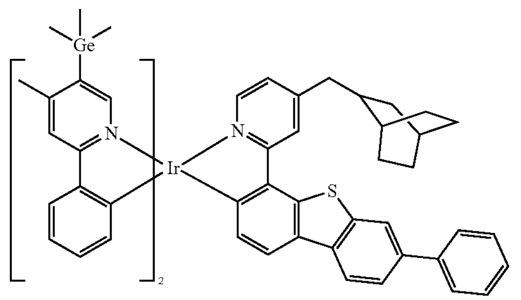
1975
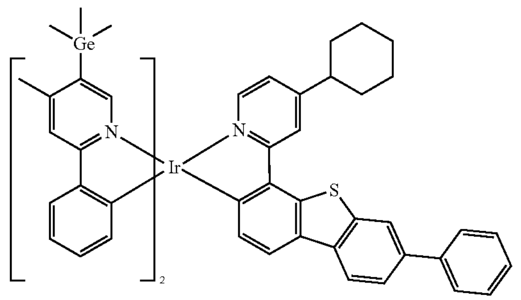
1976
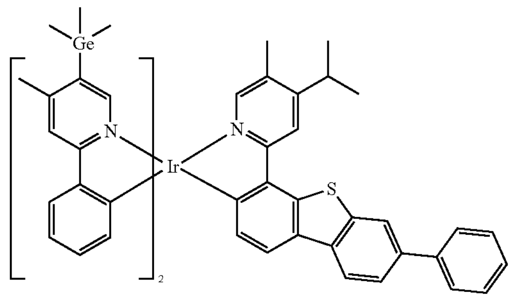
-continued
1977
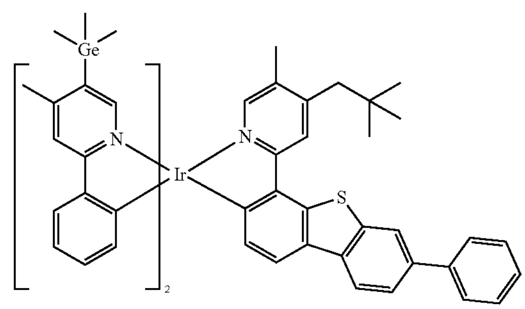
1978
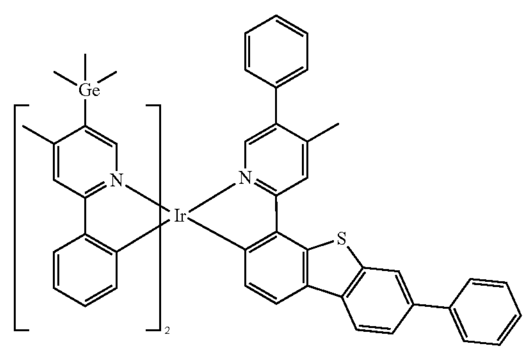
1979
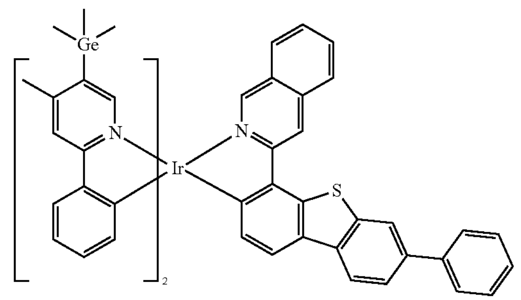
1980
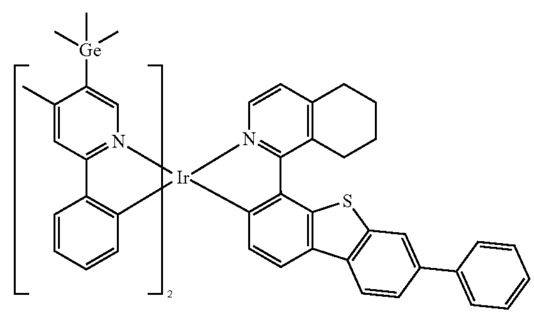

-continued
1981
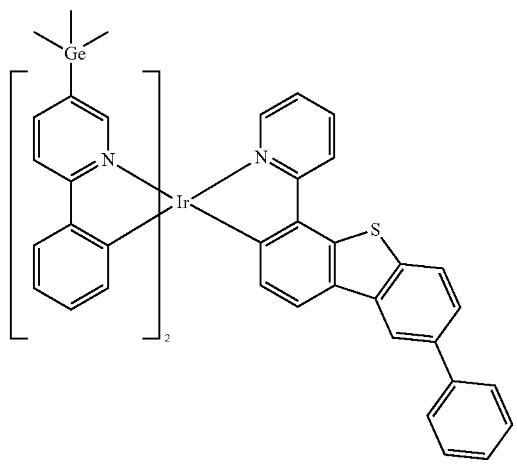
1982
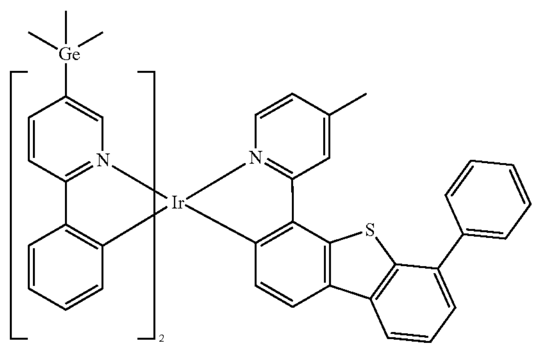
1983
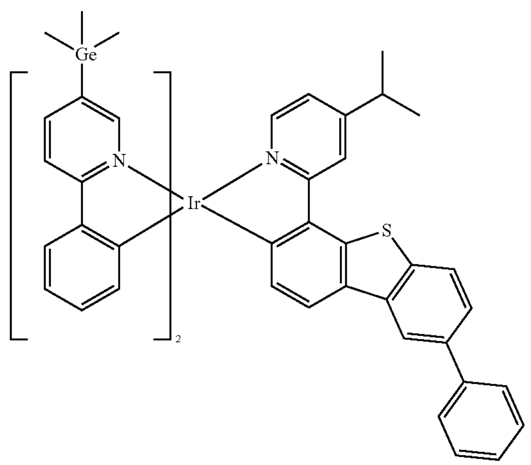
-continued
1984
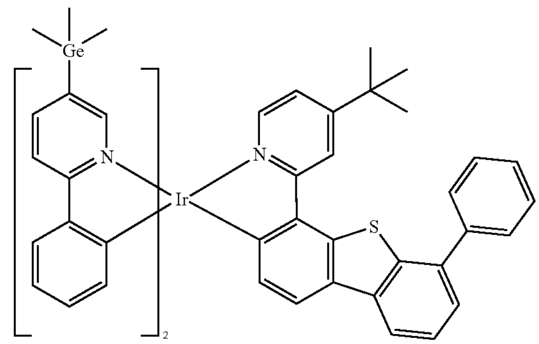
1985
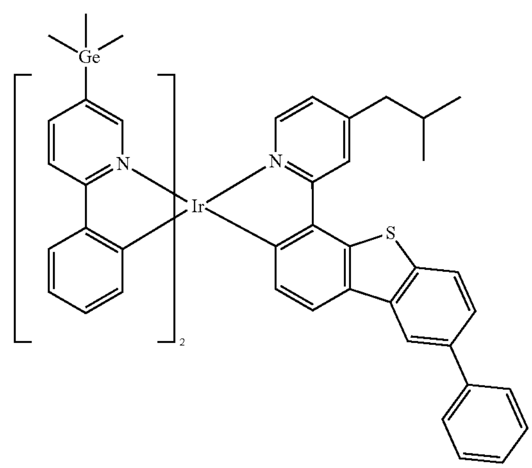
1986
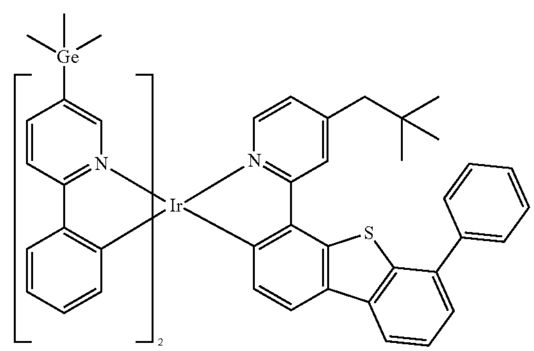

-continued
1987
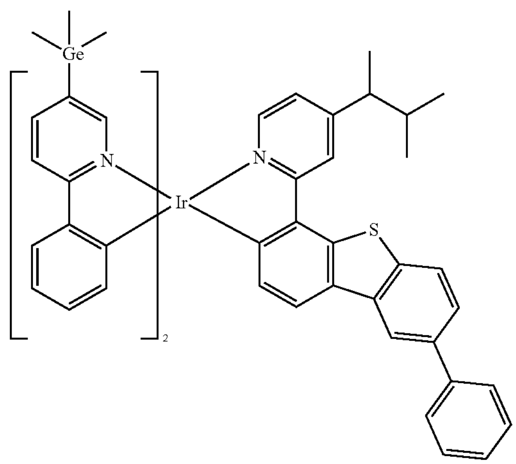
1988
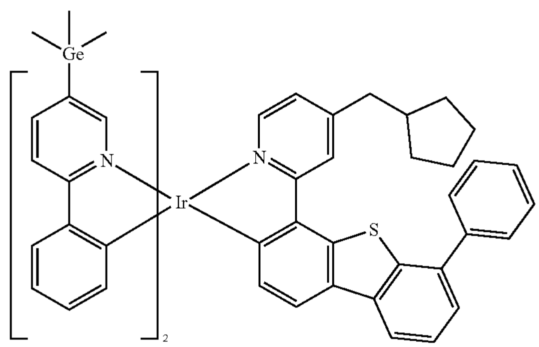
1989
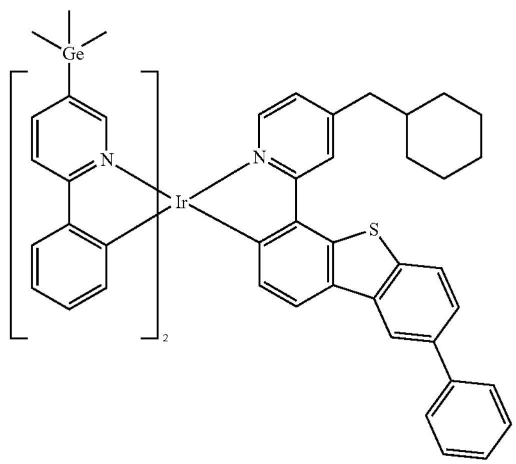
-continued
1990
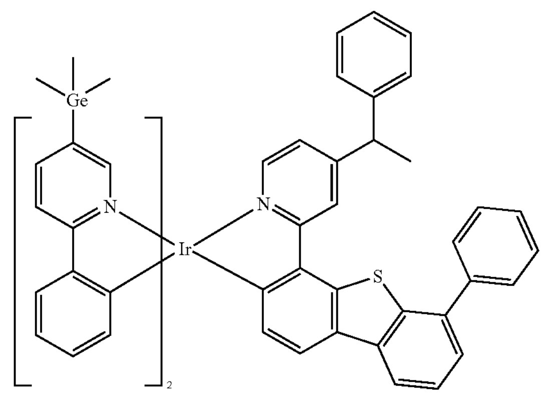
1991
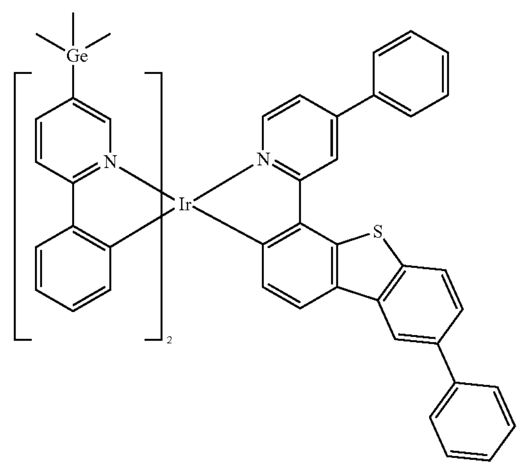
1992
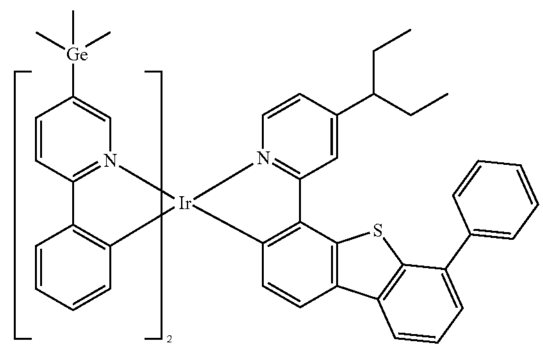

-continued
1993
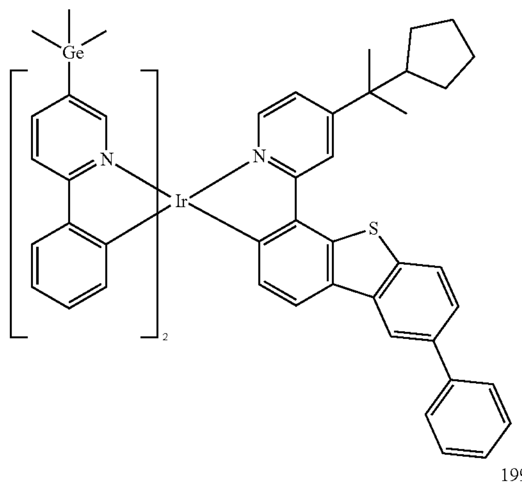
1994
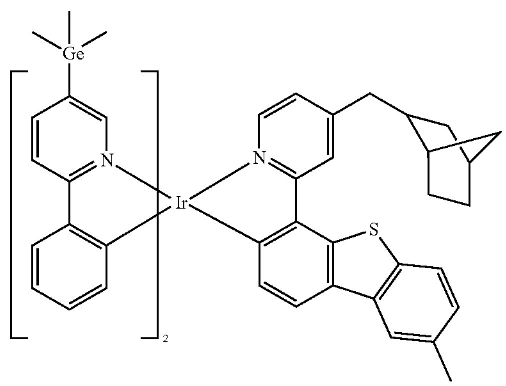
1995
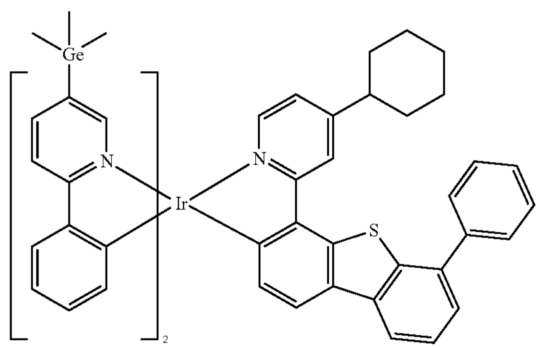
-continued
1996
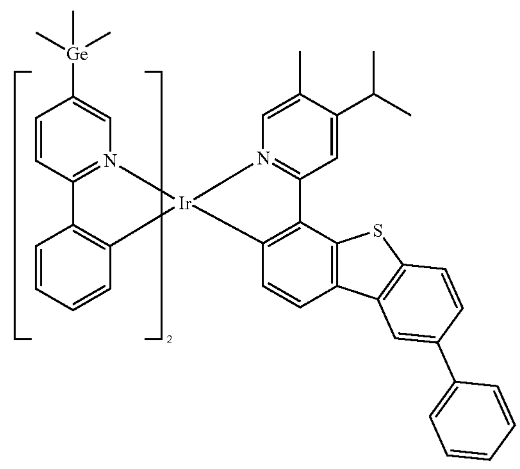
1997
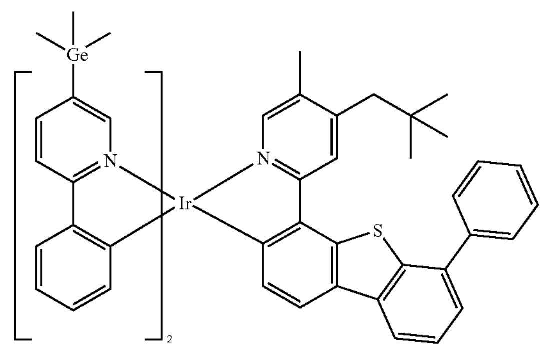
1998
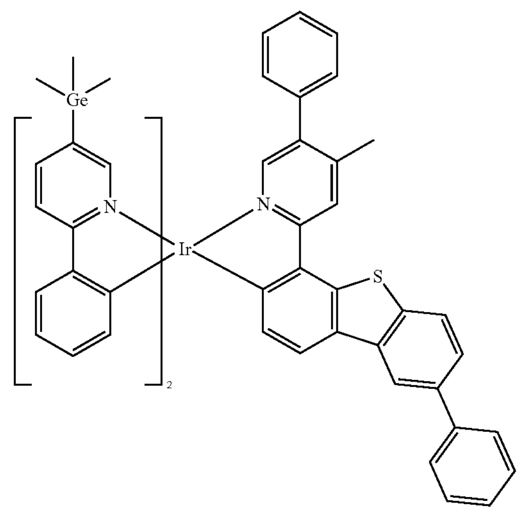

-continued
1999
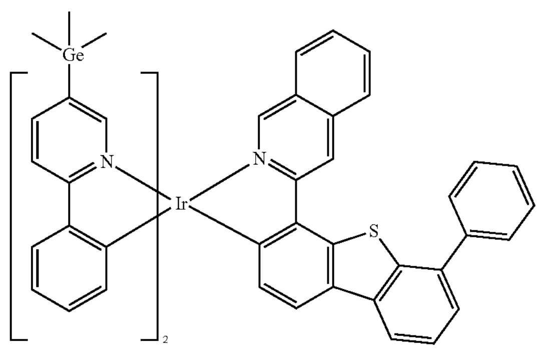
2000
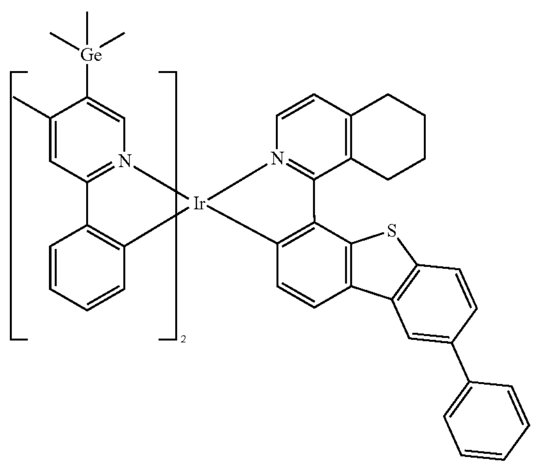
2001
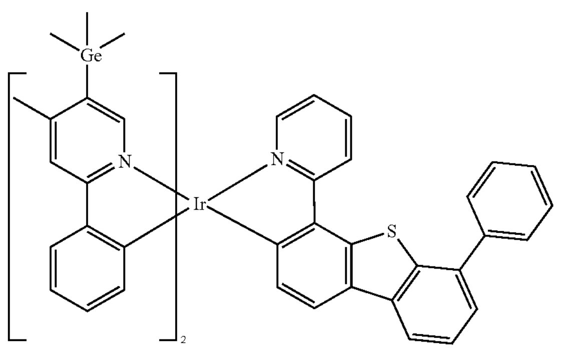
-continued
2002
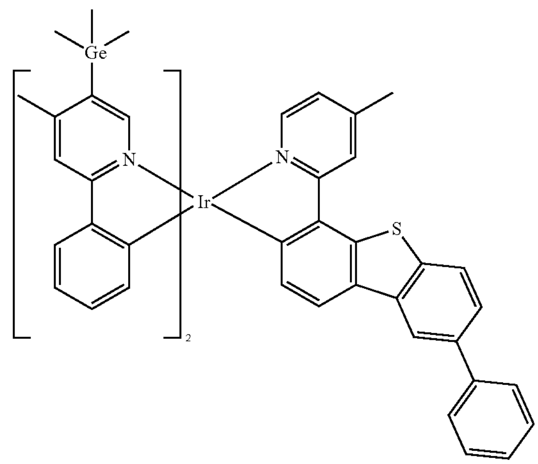
2003
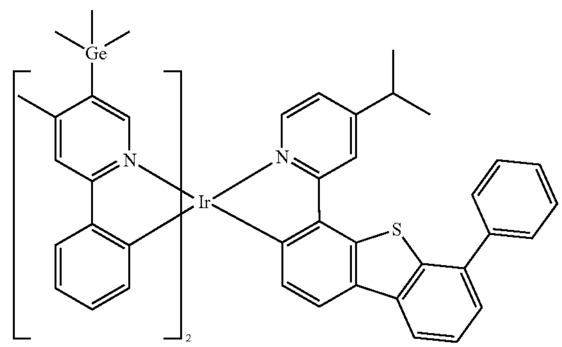
2004
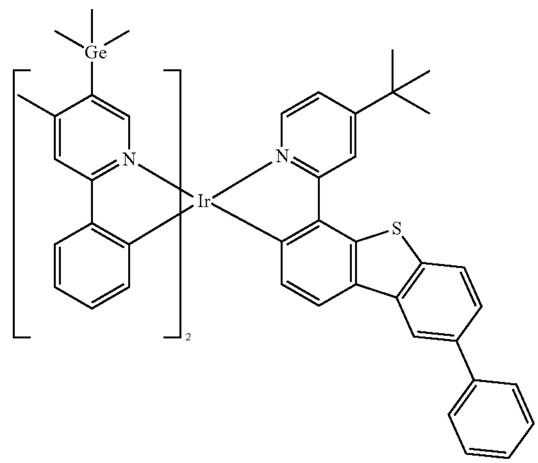

-continued
2005
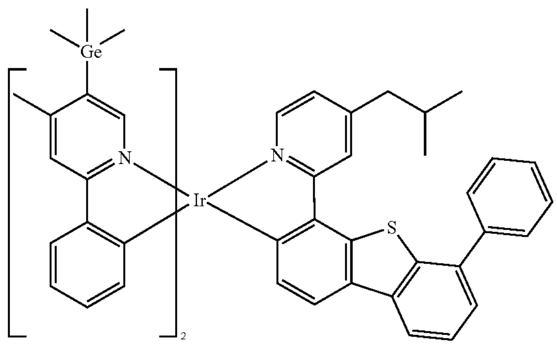
2006
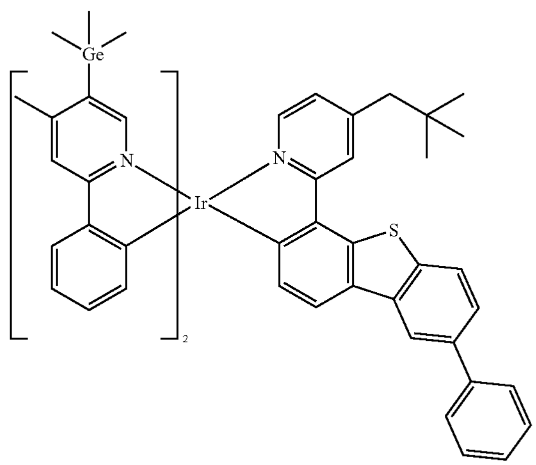
2007
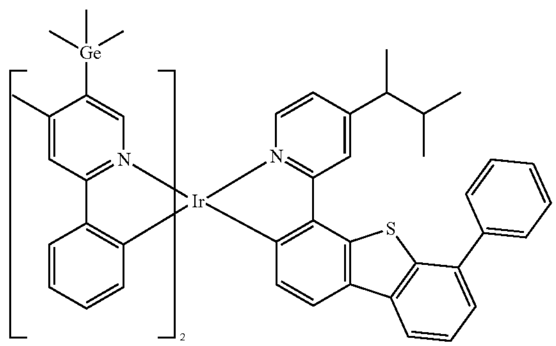
-continued
2008
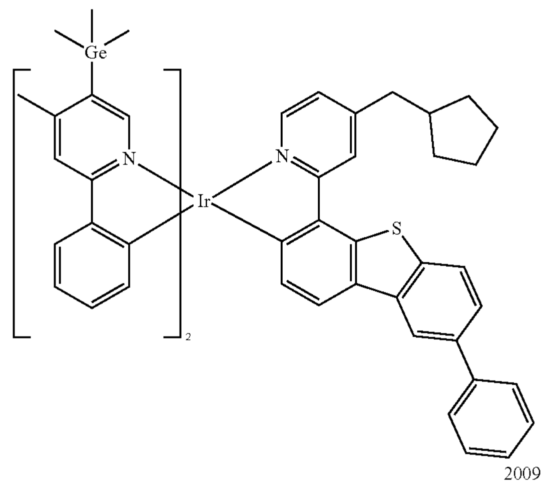
2009
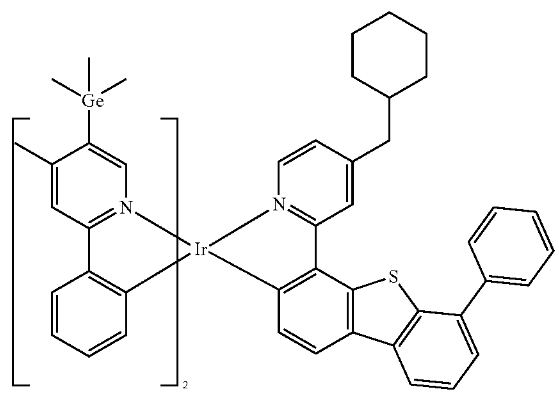
2010
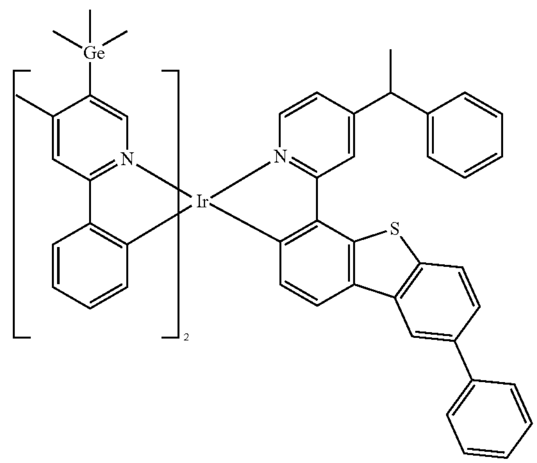

-continued
2011
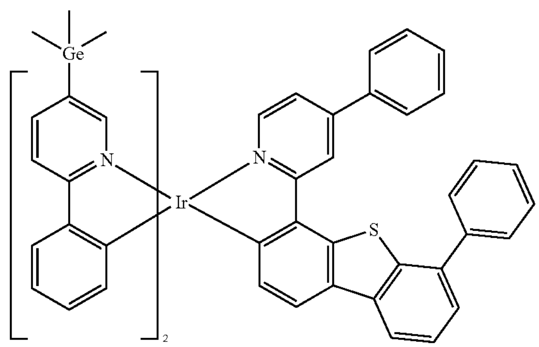
2012
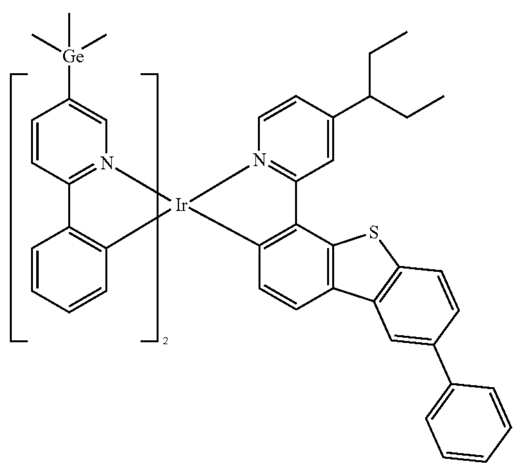
2013
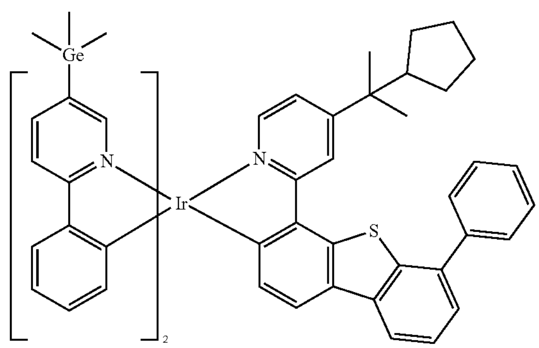
-continued
2014
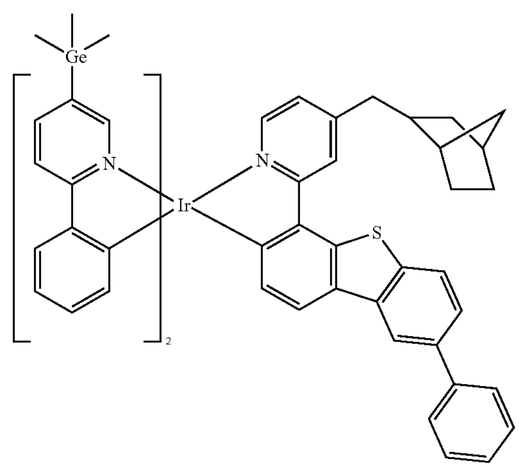
2015
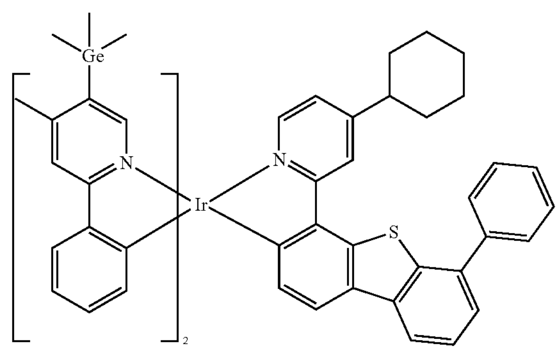
2016
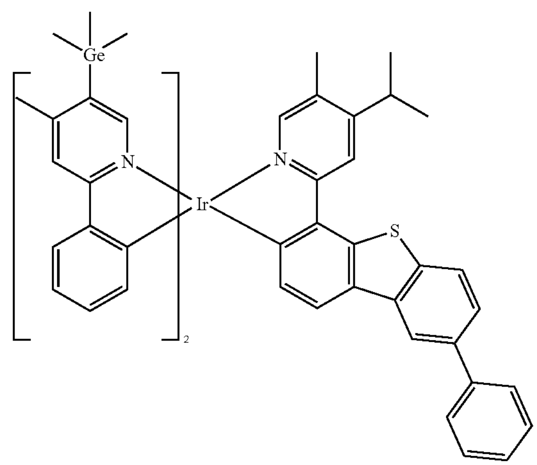

-continued
2017
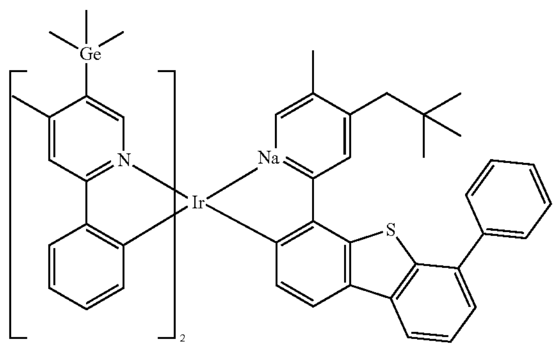
2018
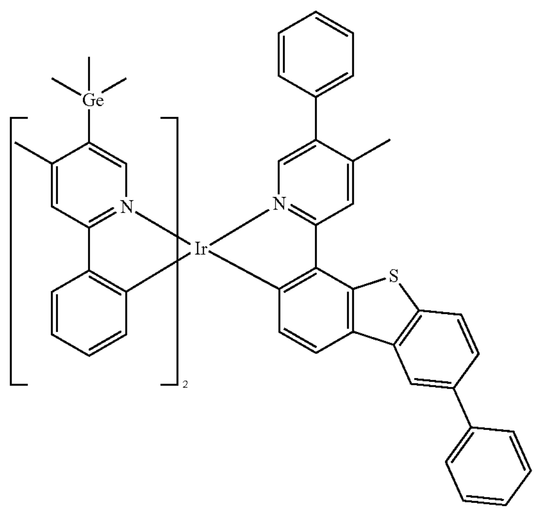
2019
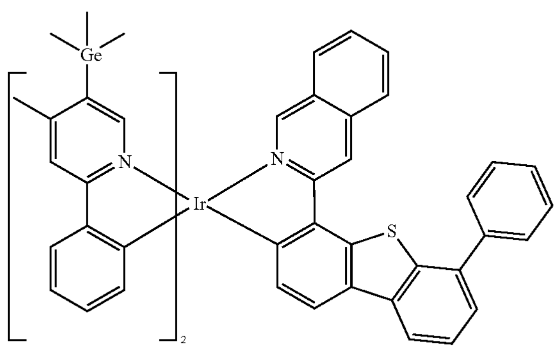
-continued
2020
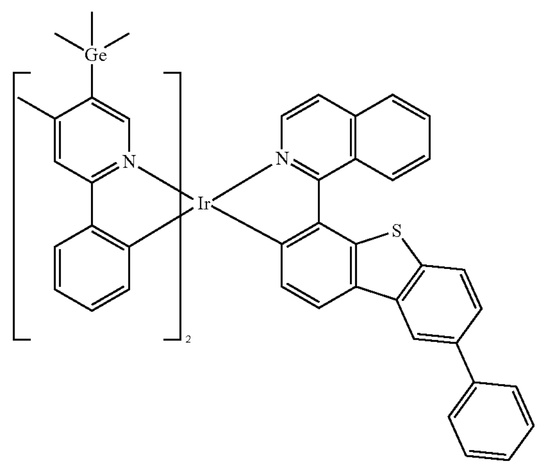
2021
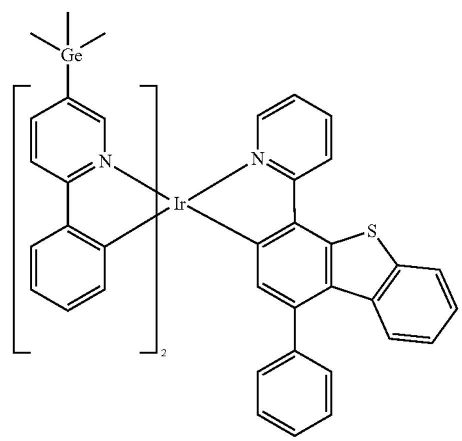
2022
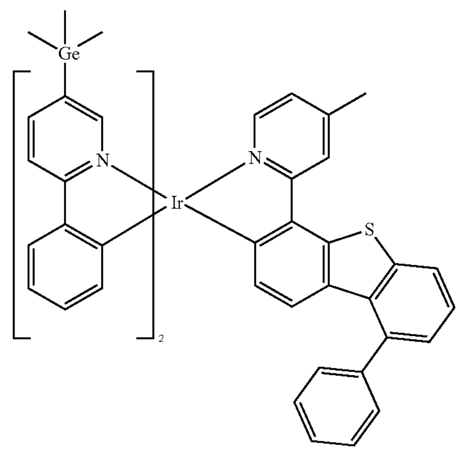

-continued
2023
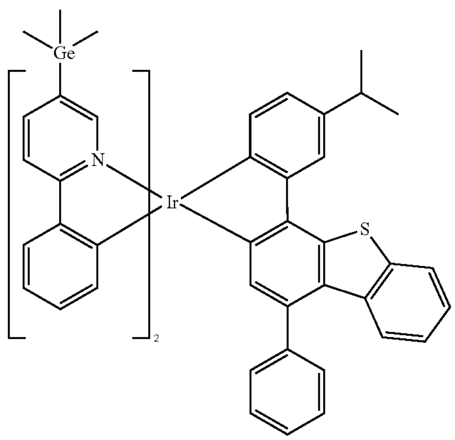
2024
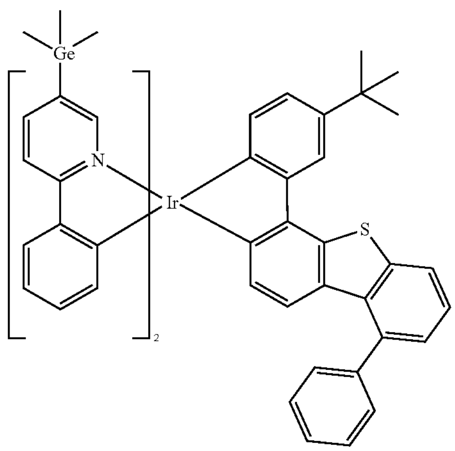
2025
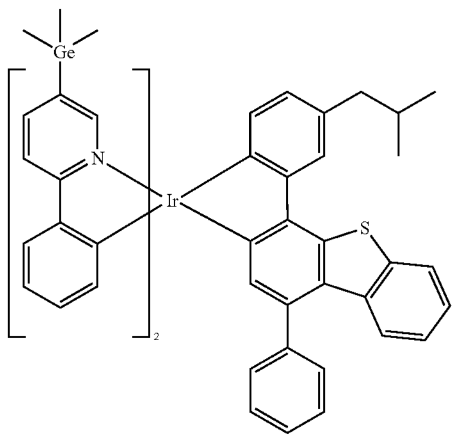
-continued
2026
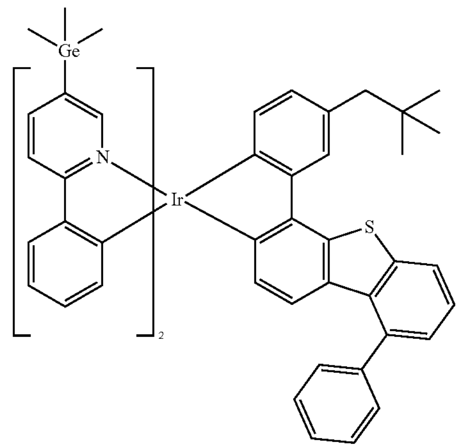
2027
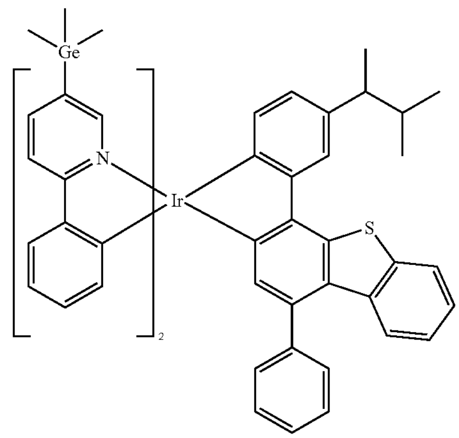
2028
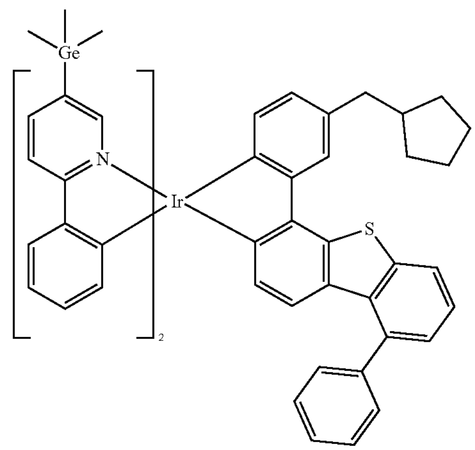

-continued
2029
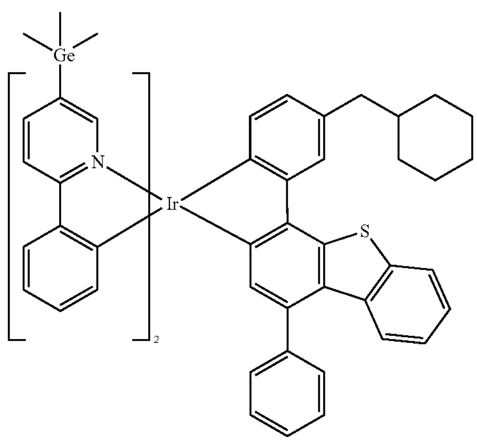
2030
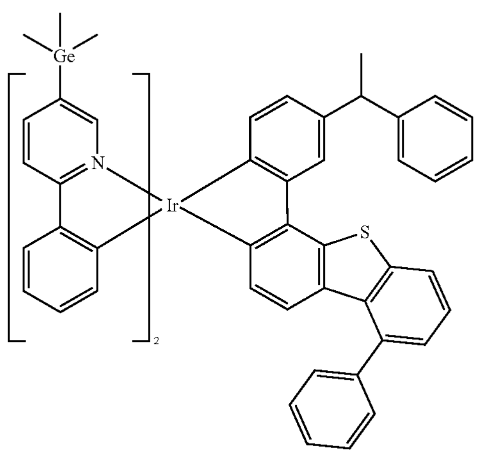
2031
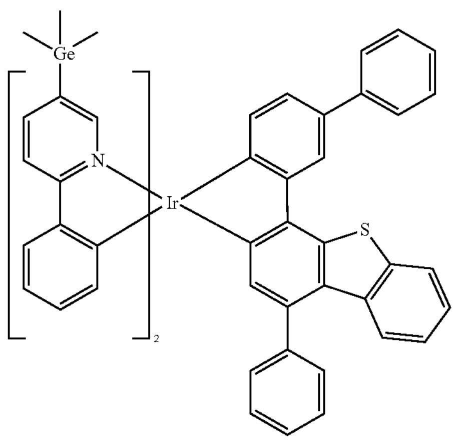
-continued
2032
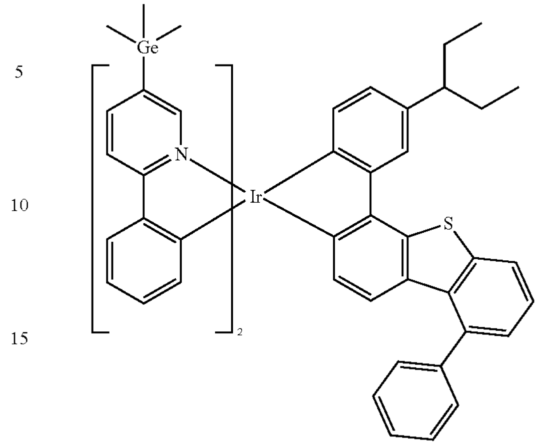
2033
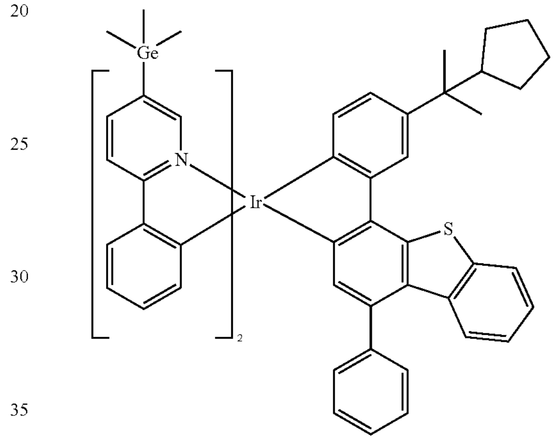
2034
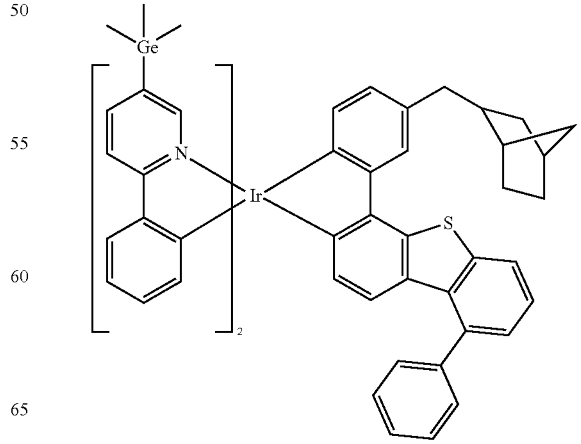

-continued
2035
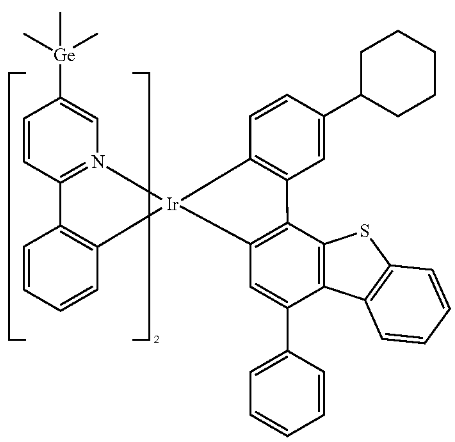
2036
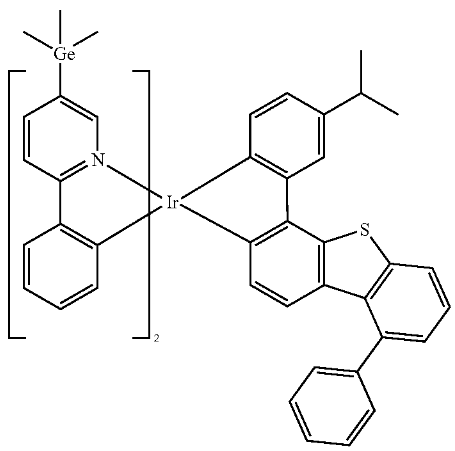
2037
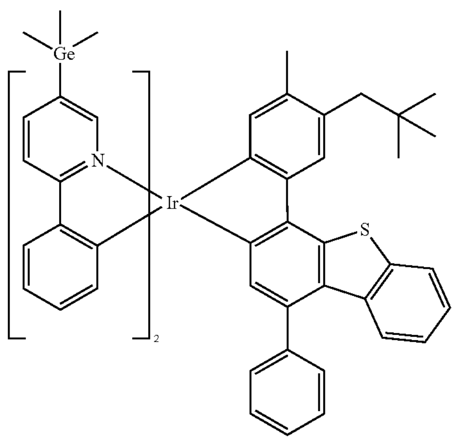
-continued
2038
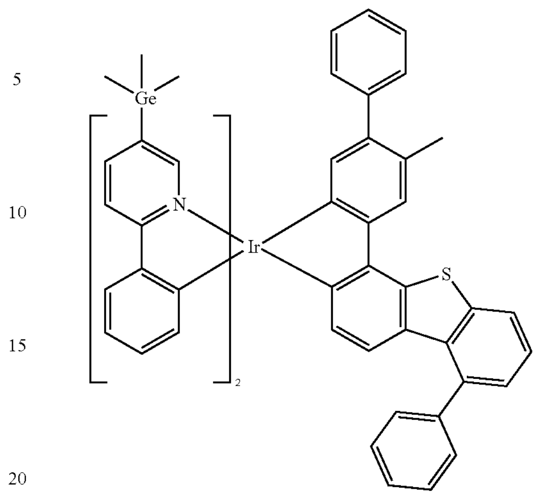
2038
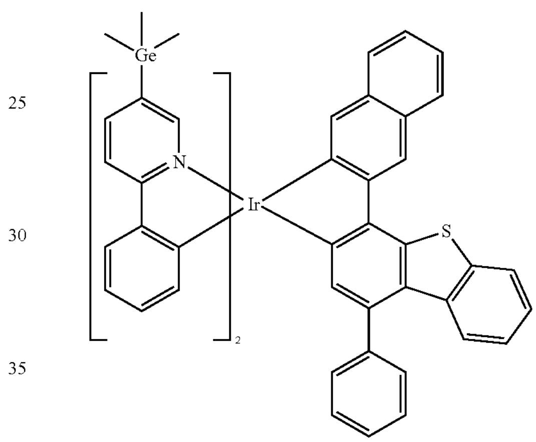
2039
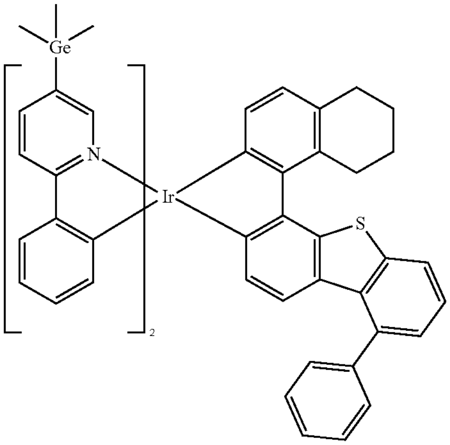

-continued
2040
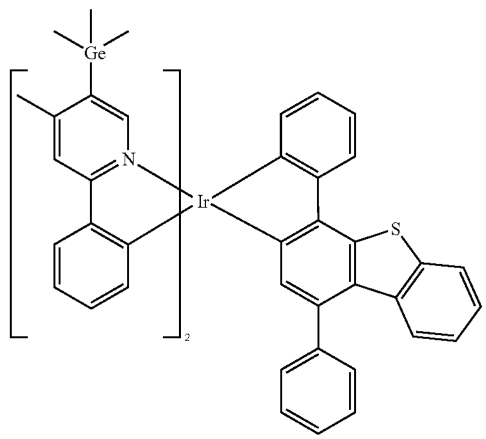
2042
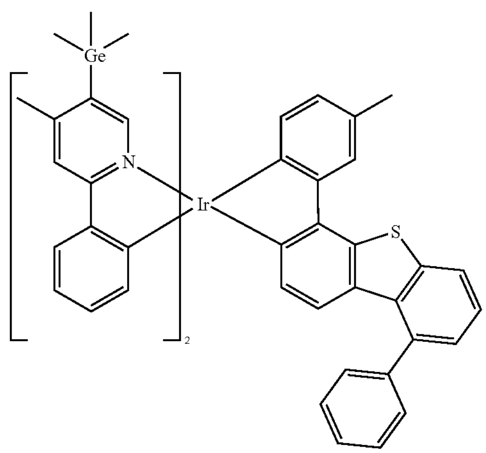
2043
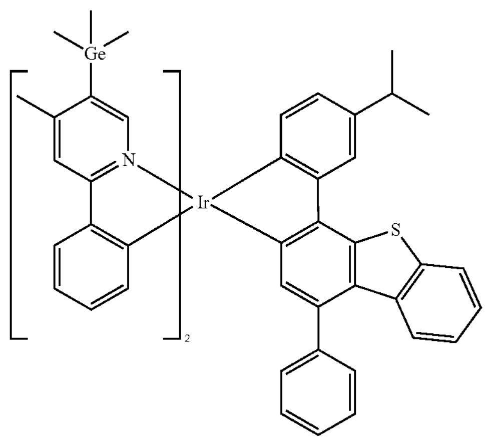
-continued
2044
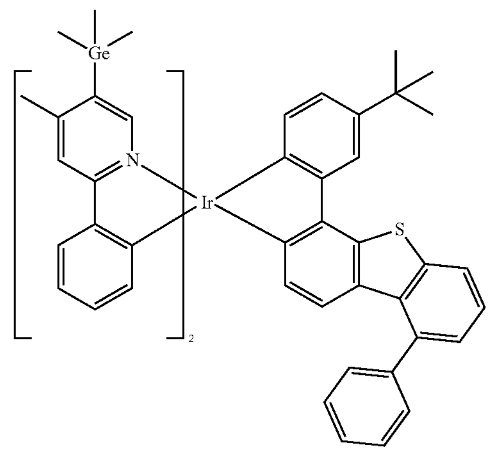
2045
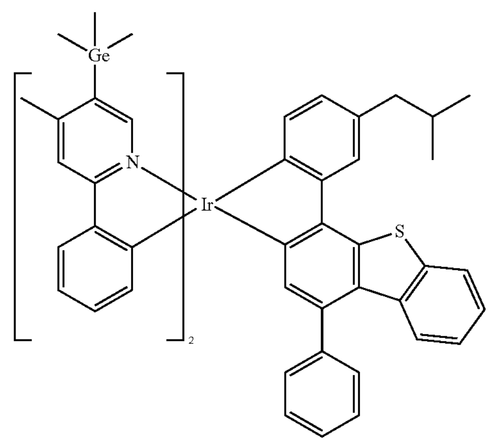
2045
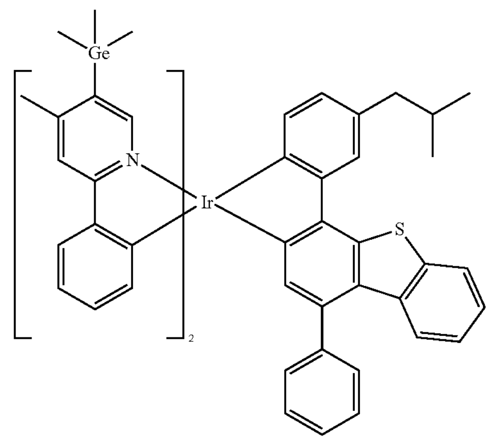

-continued
2046
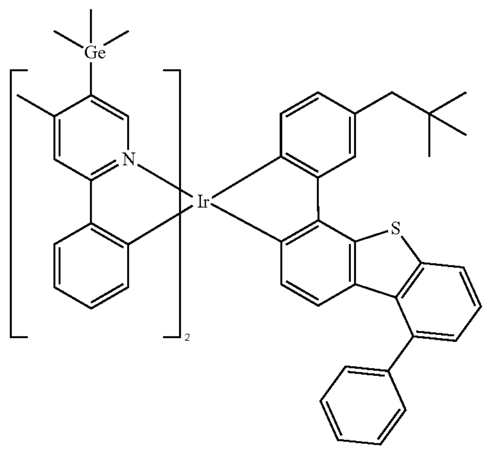
2047
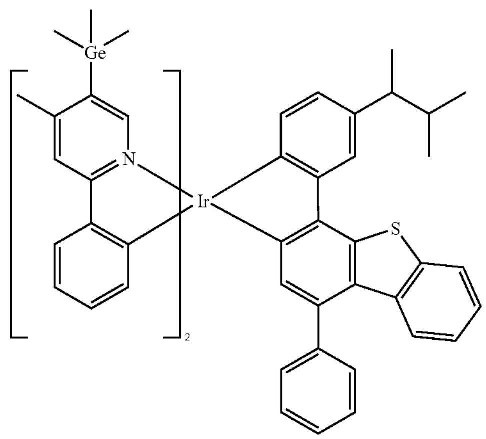
2048
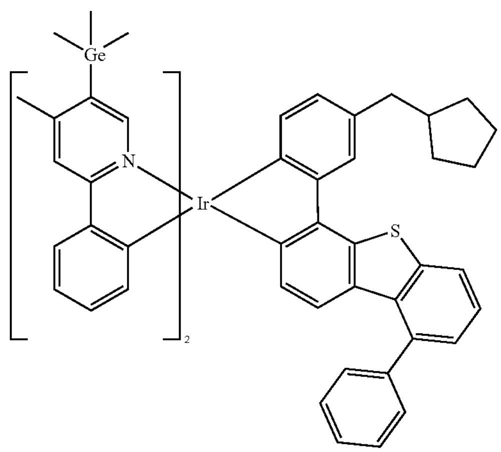
-continued
2048
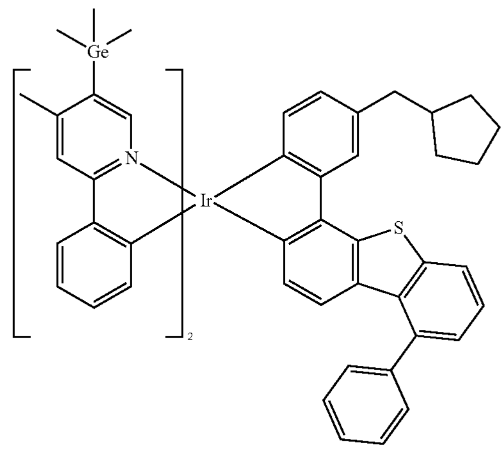
2049
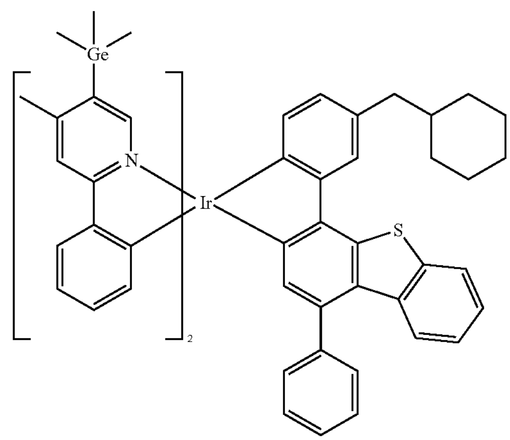
2050
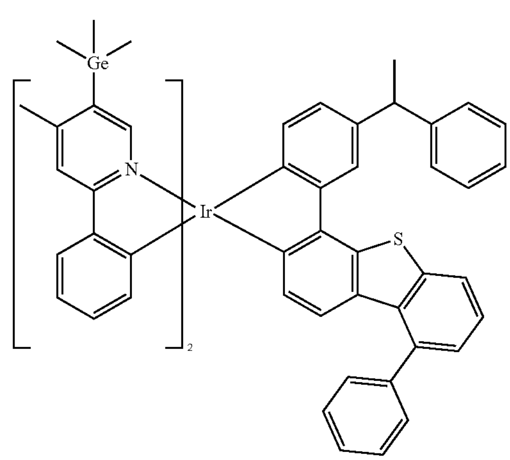

-continued
2051
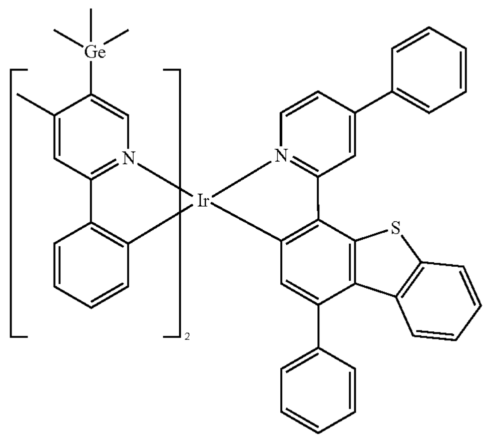
2052
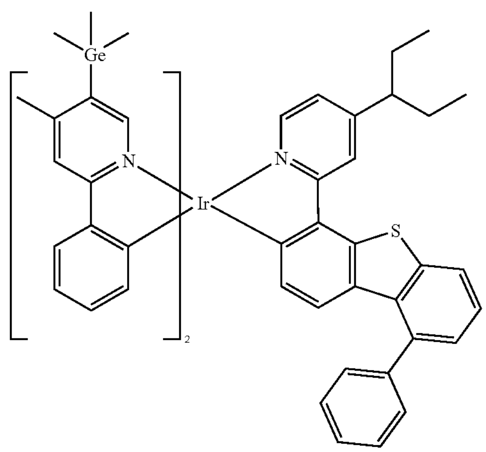
2053
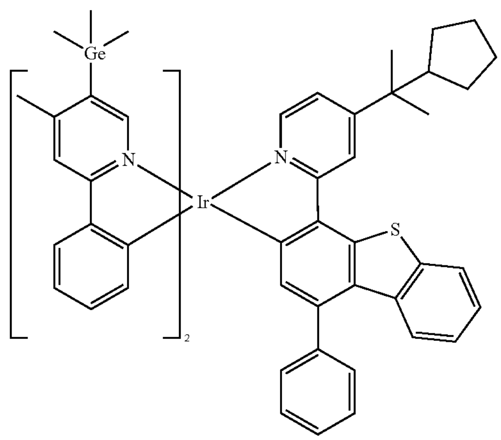
-continued
2053
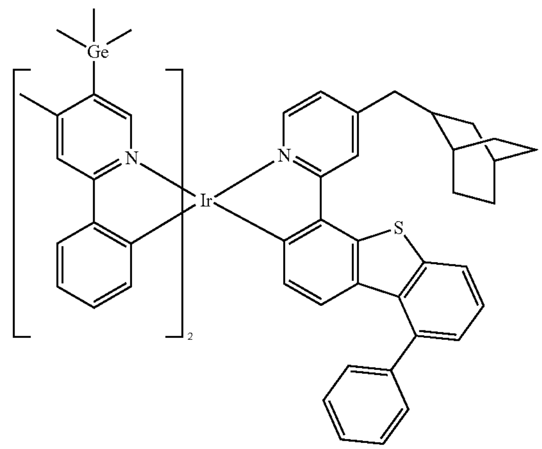
2054
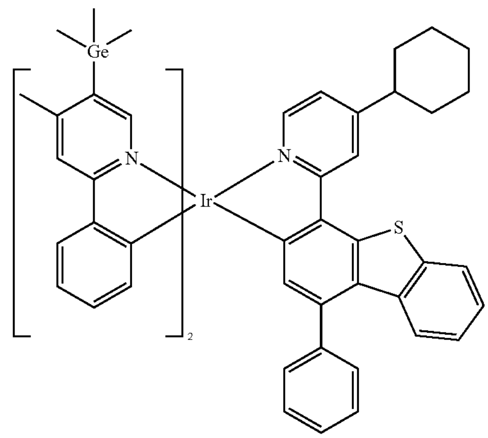
2055
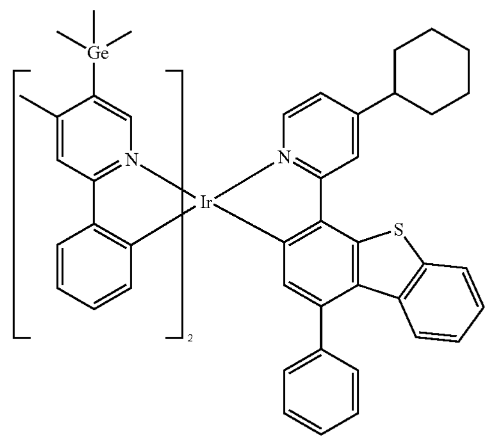

-continued
2056
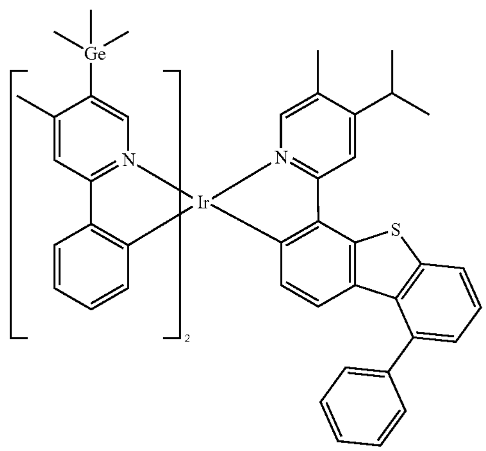
2057
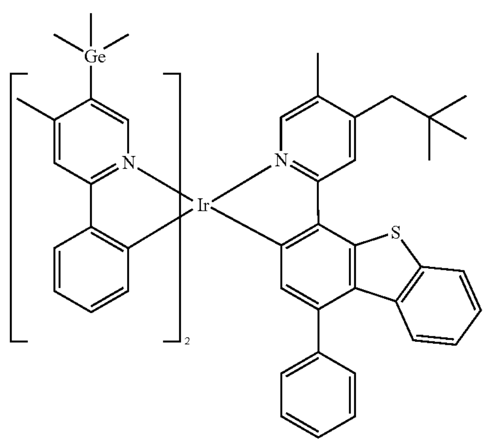
2058
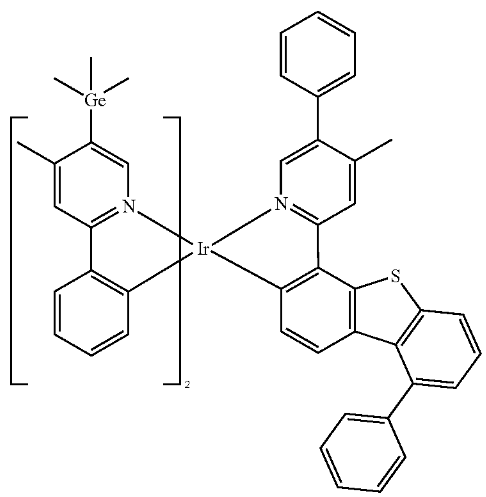
-continued
2059
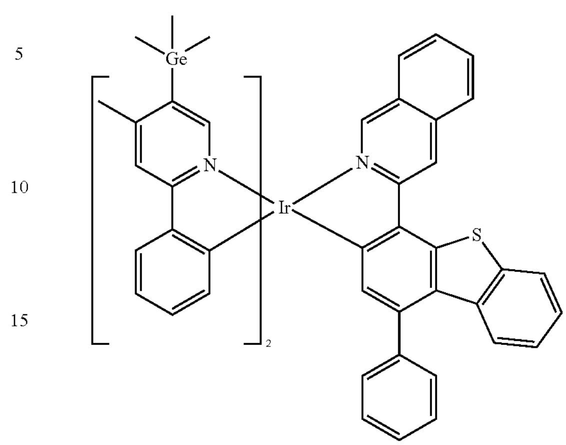
2060
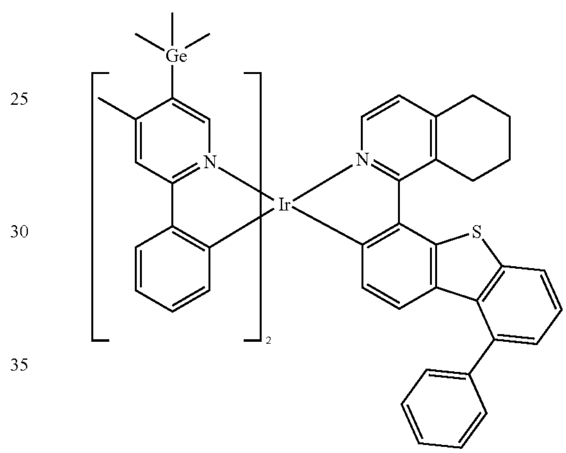
2061
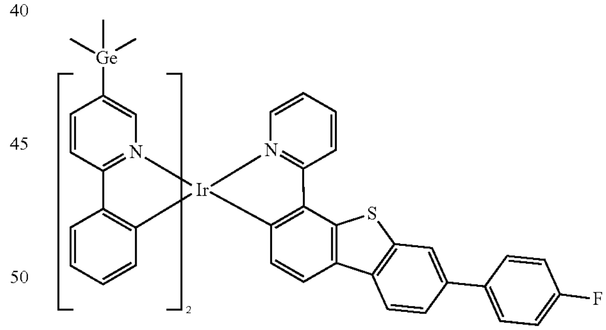
2062
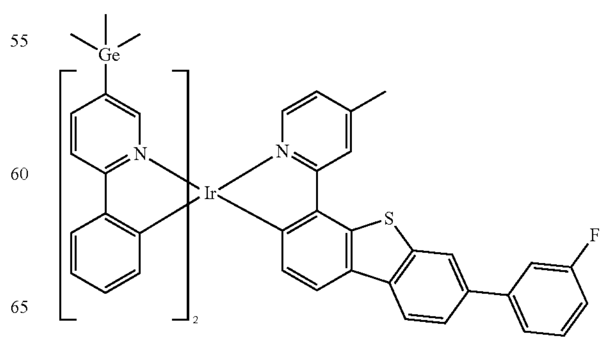

-continued
2063
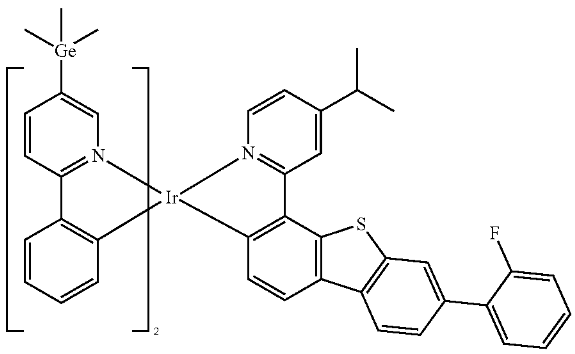
2064
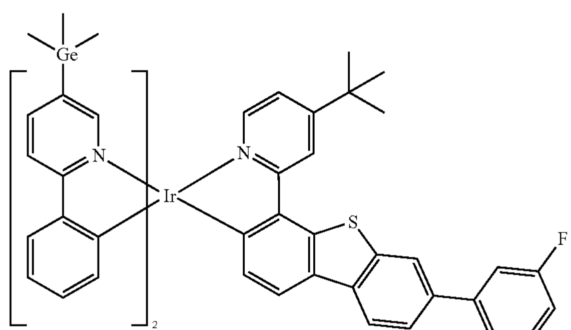
2065
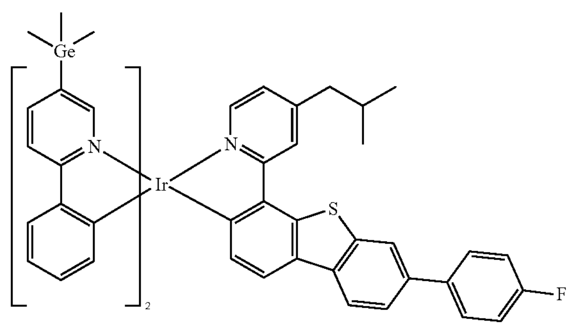
2066
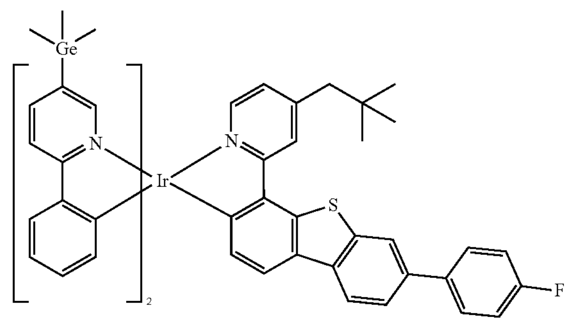
-continued
2067
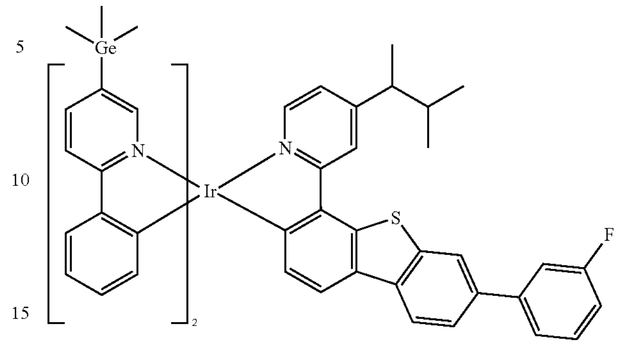
2068
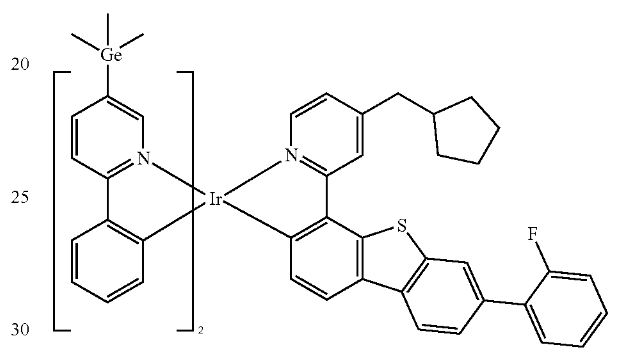
2069
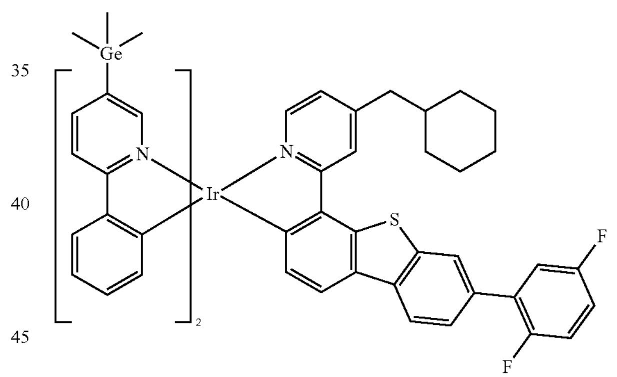
2070
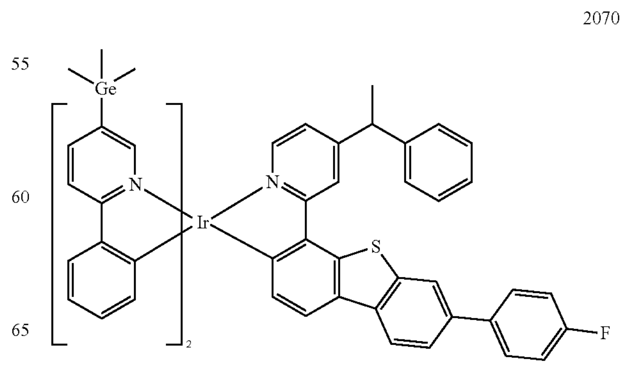

-continued
2071
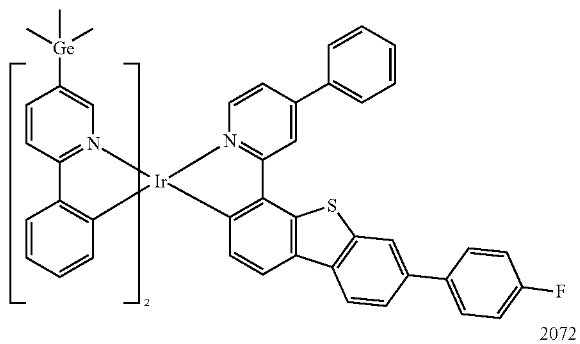
2072
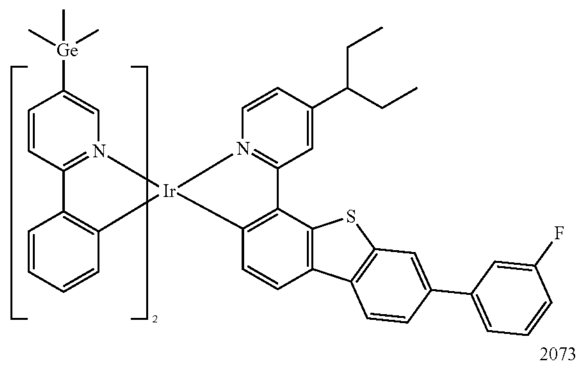
2073
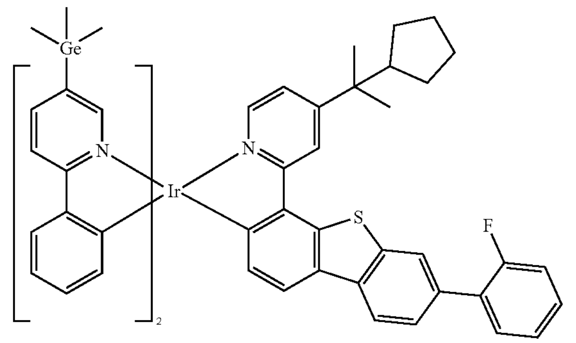
2074
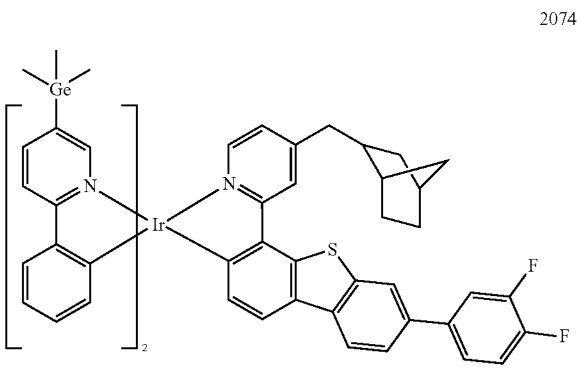
-continued
2075
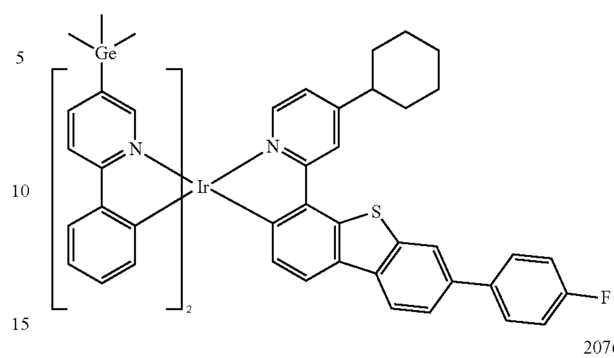
2076
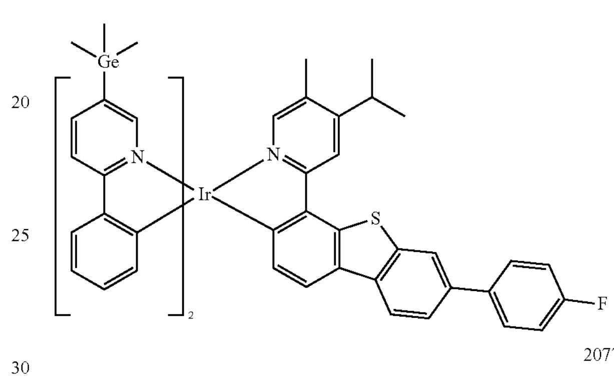
2077
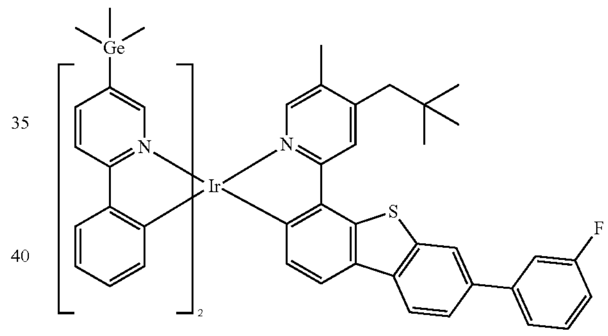
2078
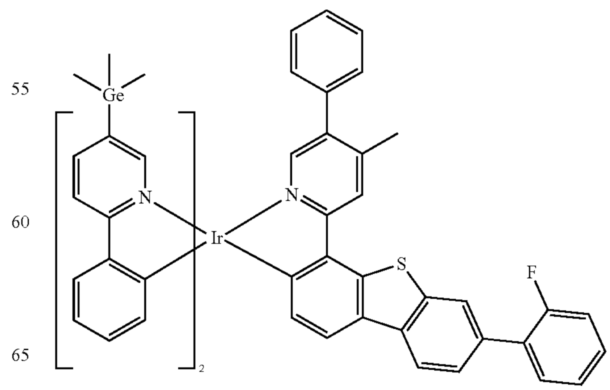

-continued
2079
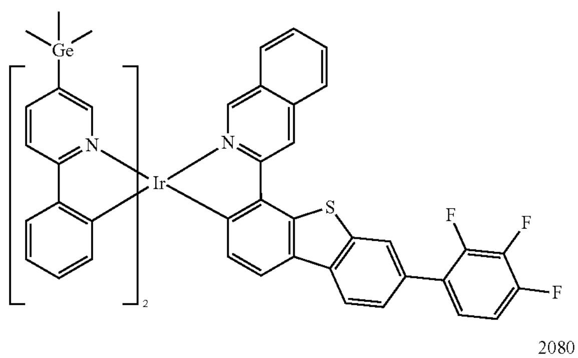
2080
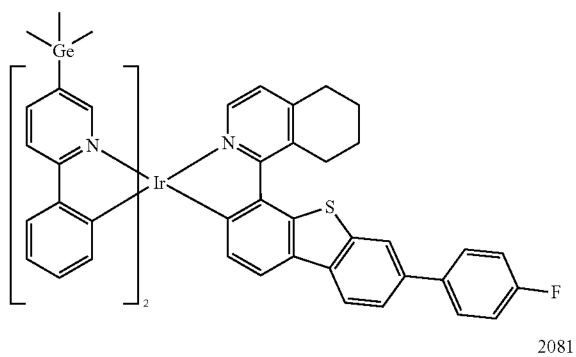
2081
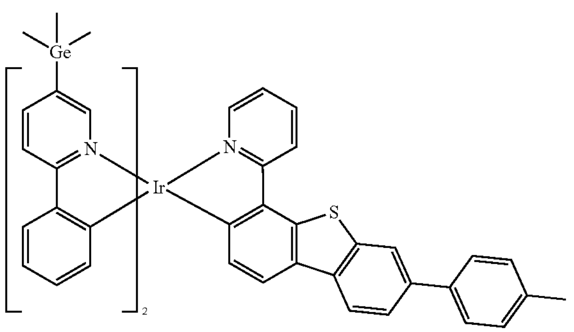
2082
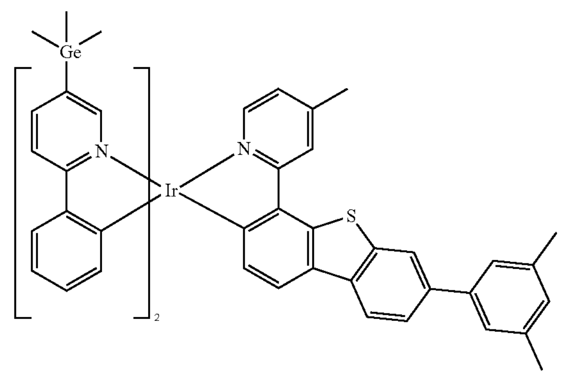
-continued
2083
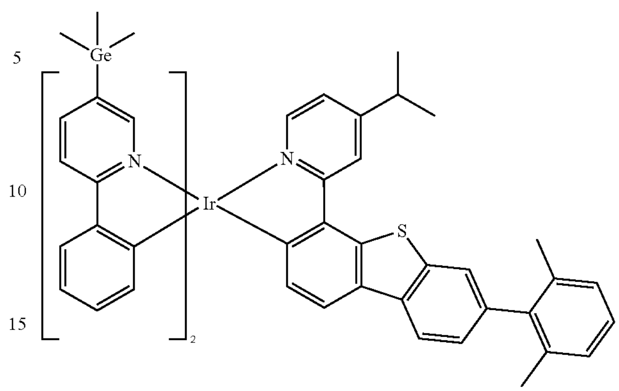
2084
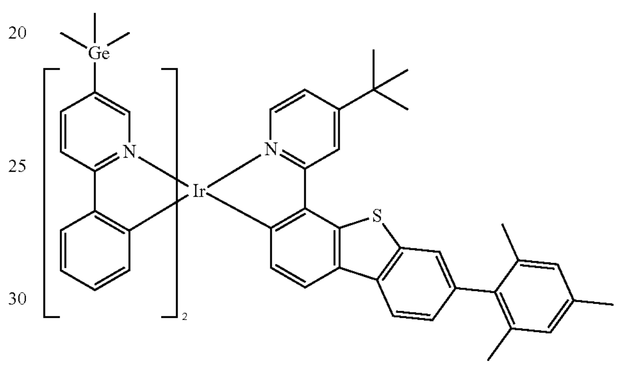
2085
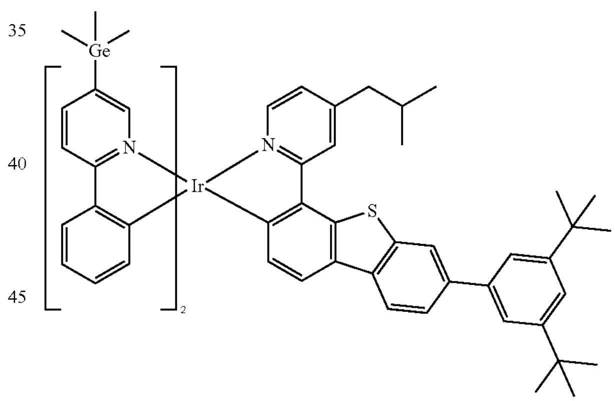
2086
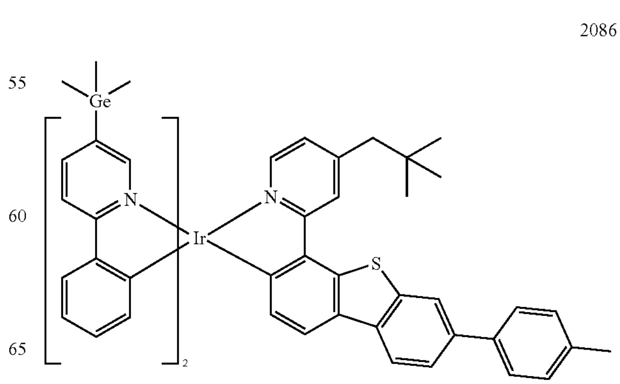

-continued
2087
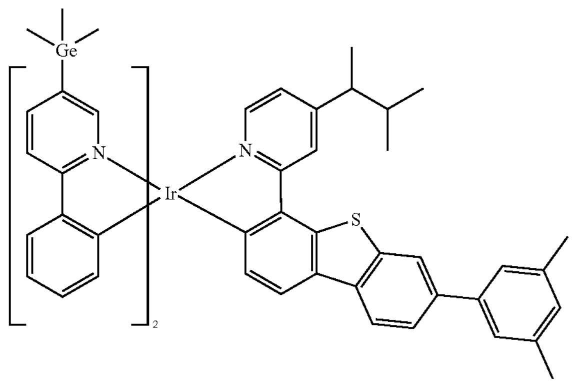
2088
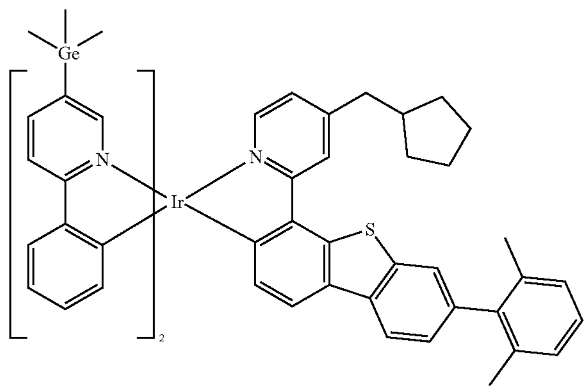
2089
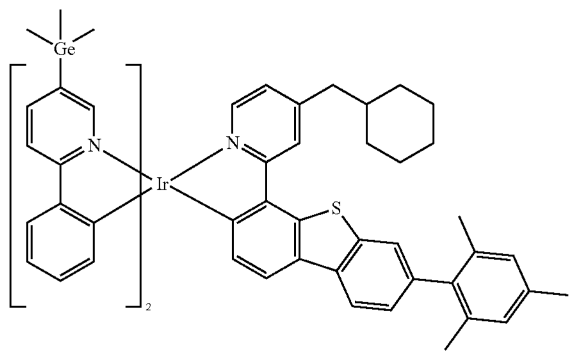
2090
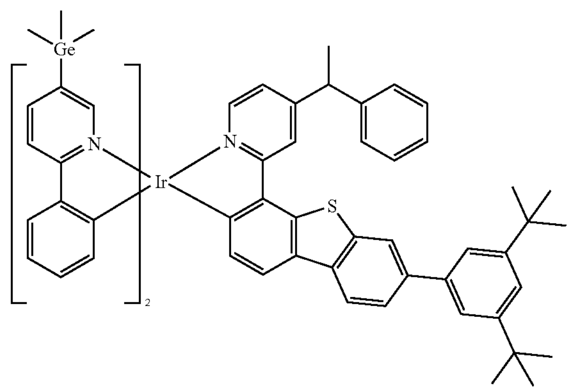
-continued
2091
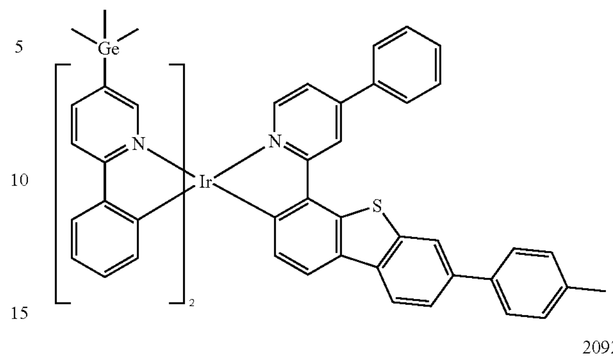
2092
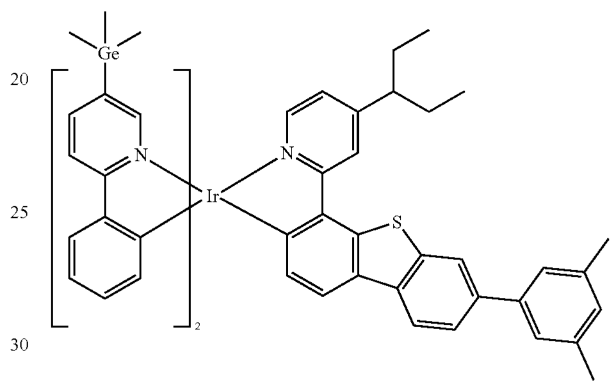
2093
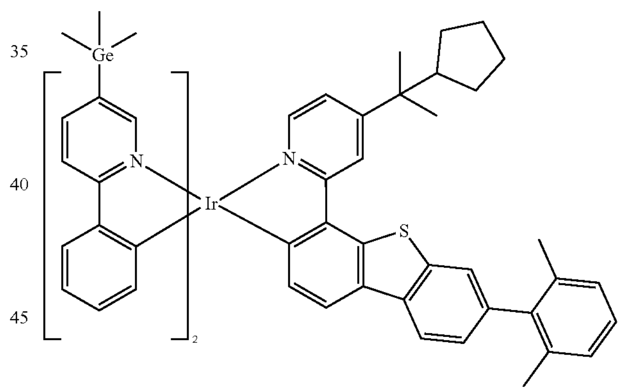
2094
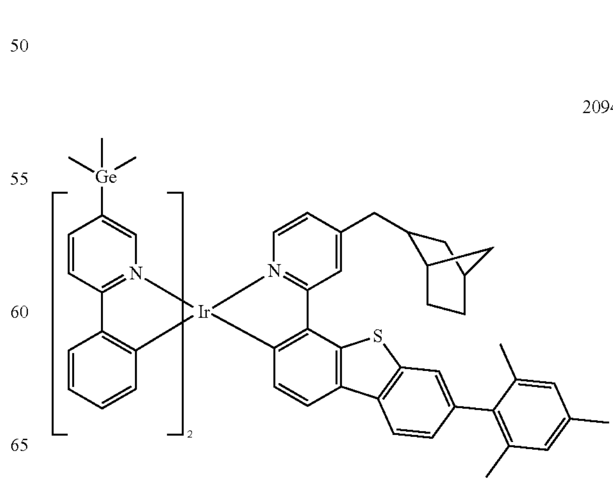

-continued
2095
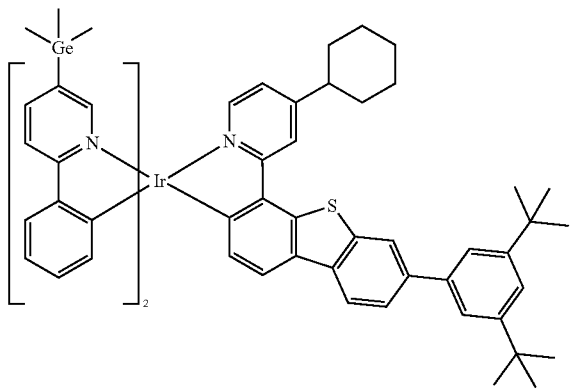
2096
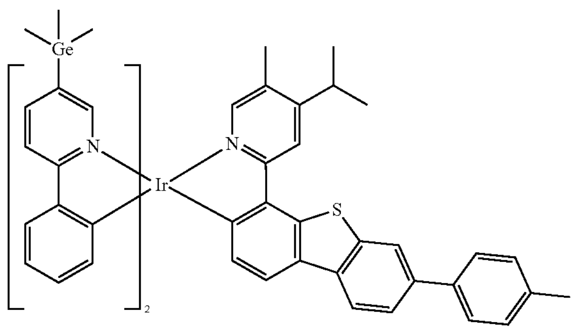
2097
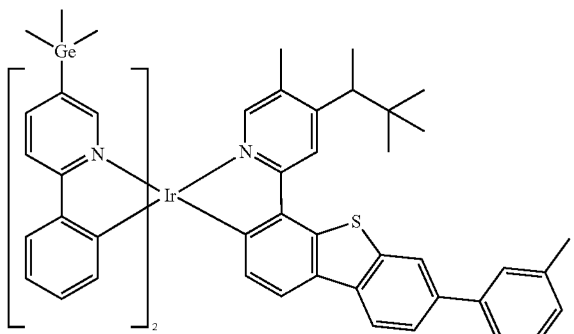
2098
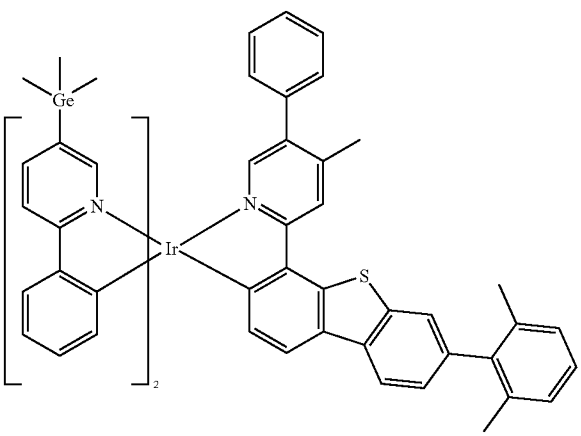
-continued
2099
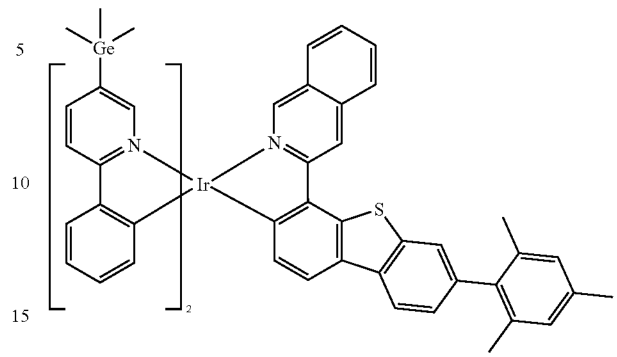
2100
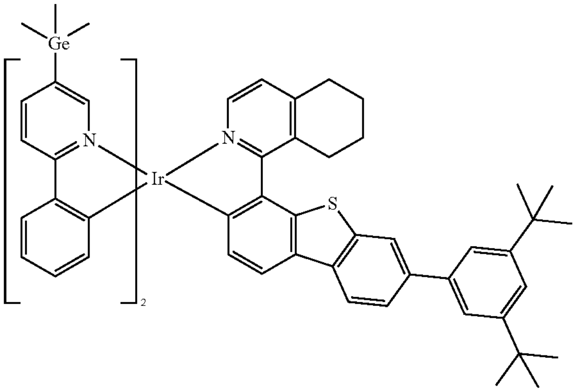
2101
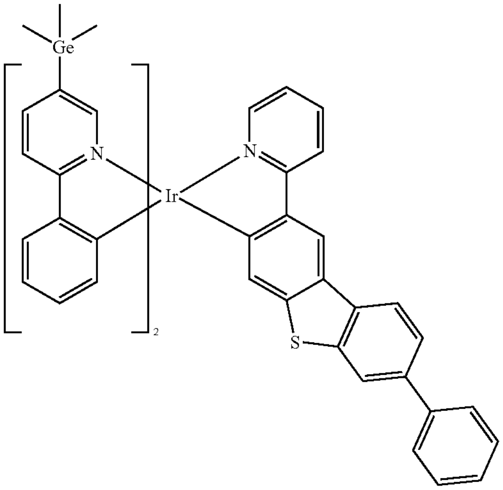

-continued
2102
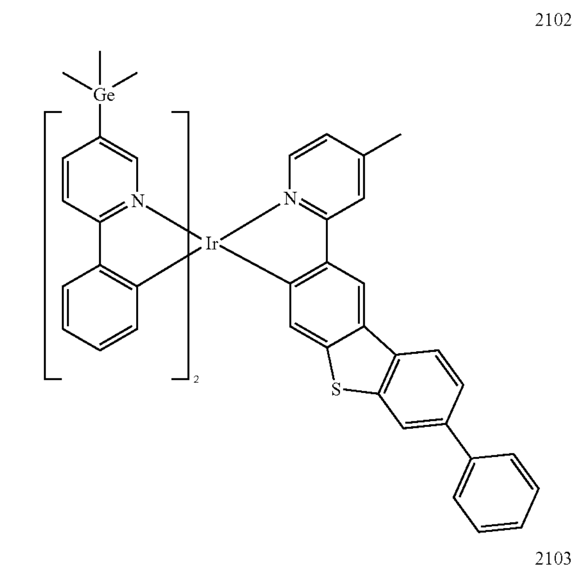
2103
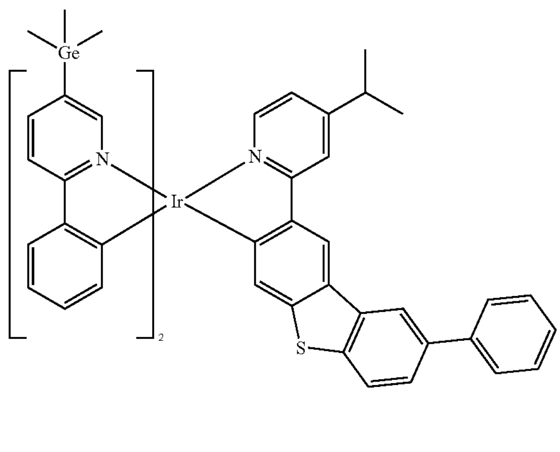
2104
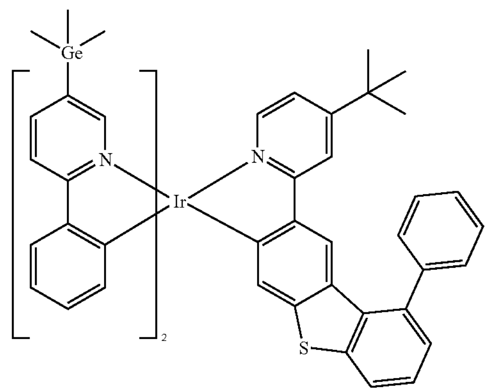
-continued
2105
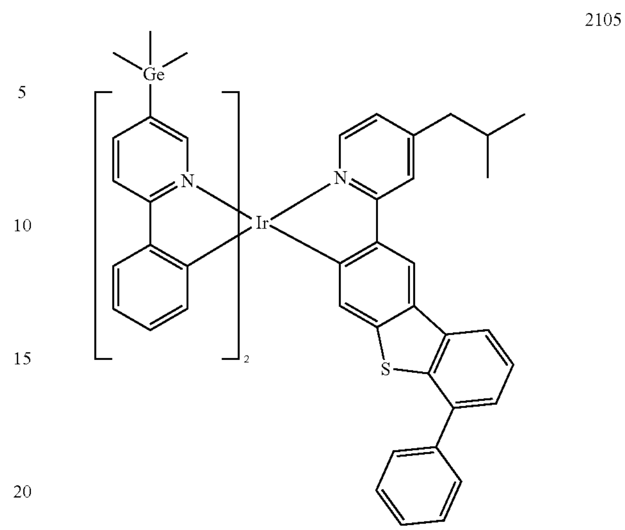
2106
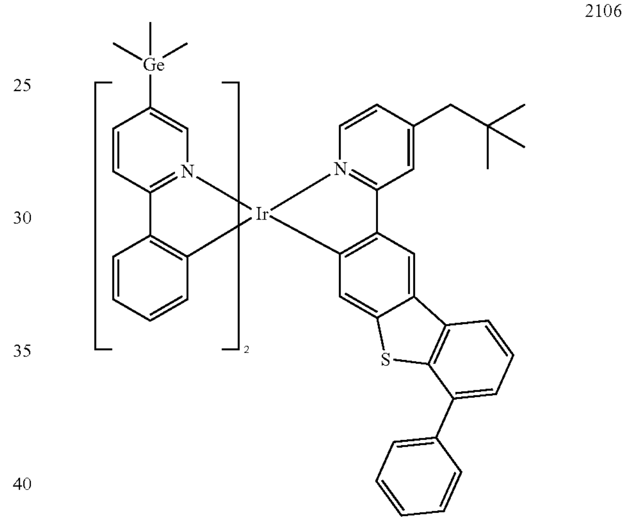
2107
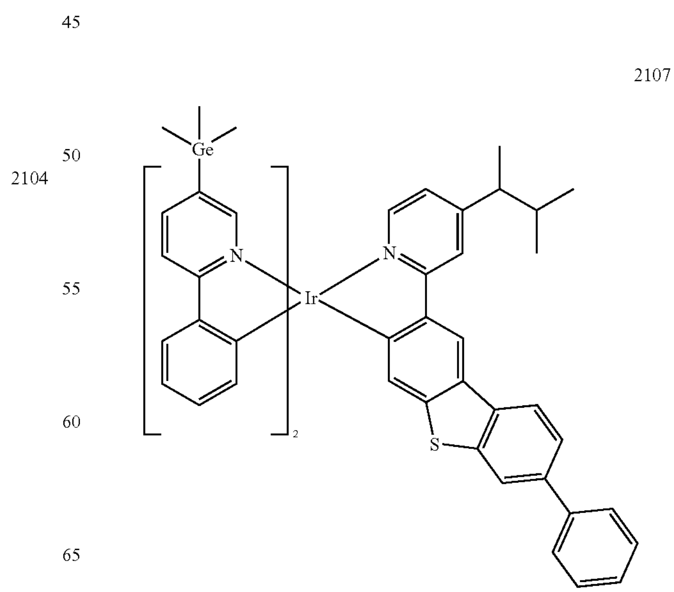

-continued
2108
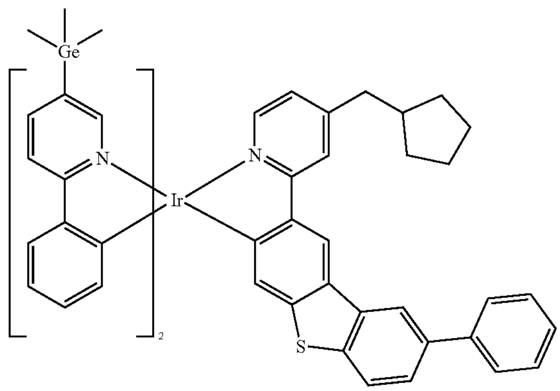
2109
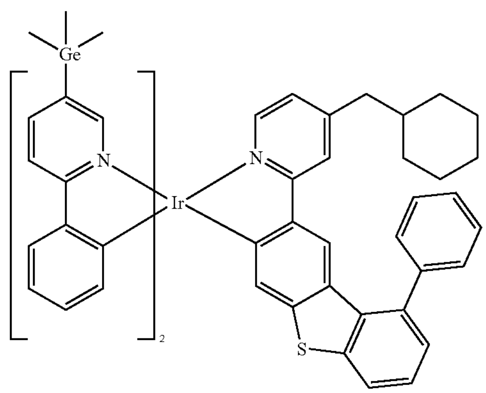
2110
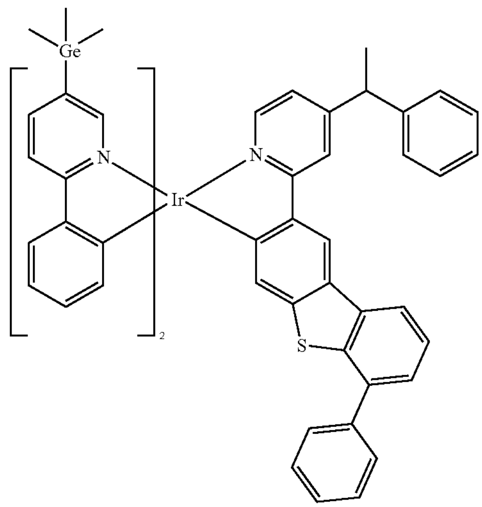
-continued
2111
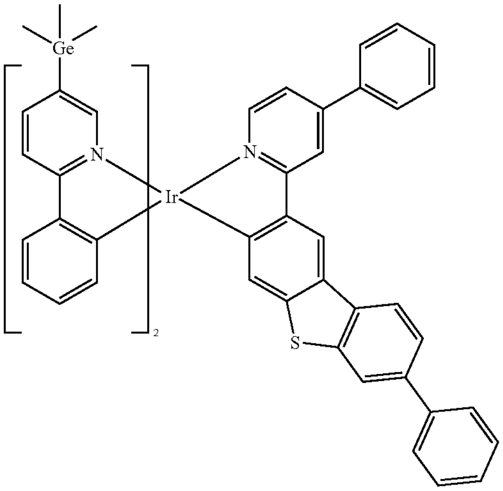
2112
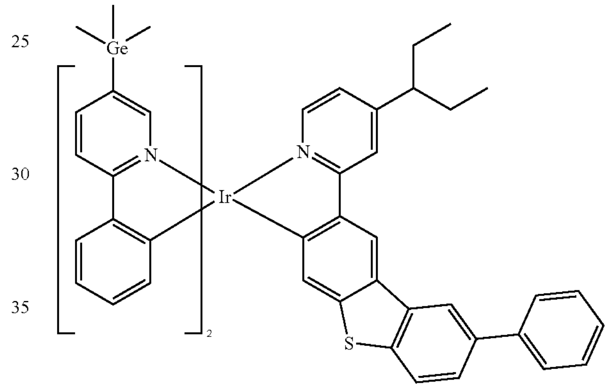
2113
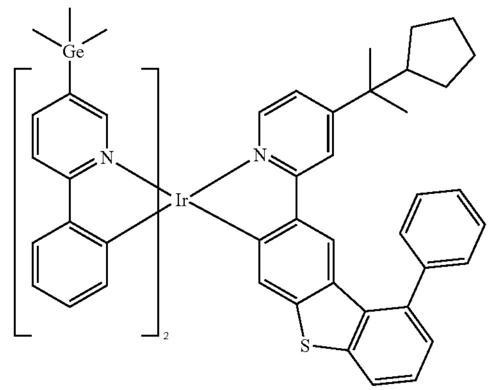

-continued
2114
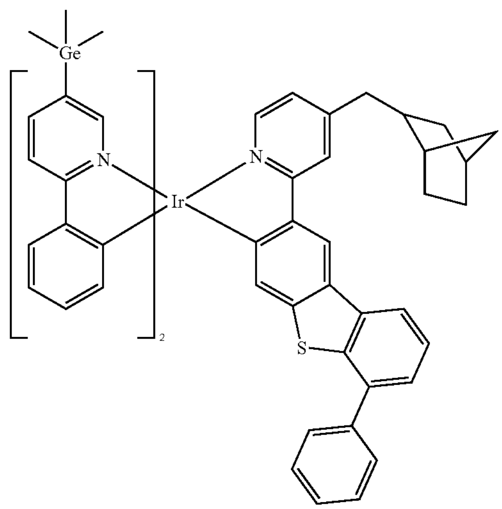
2115
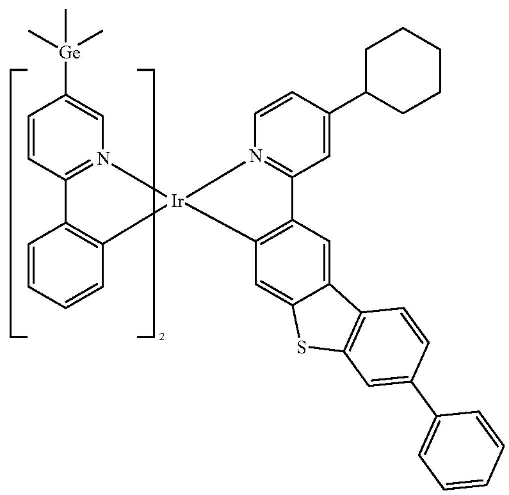
2116
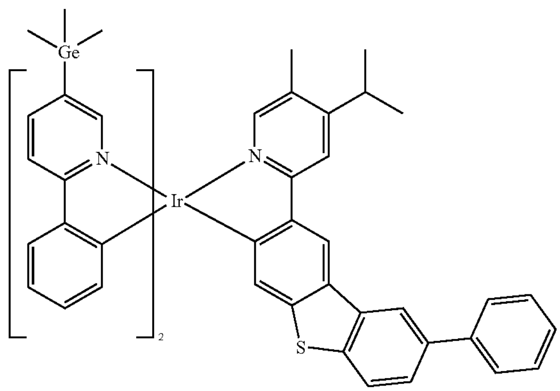
-continued
2117
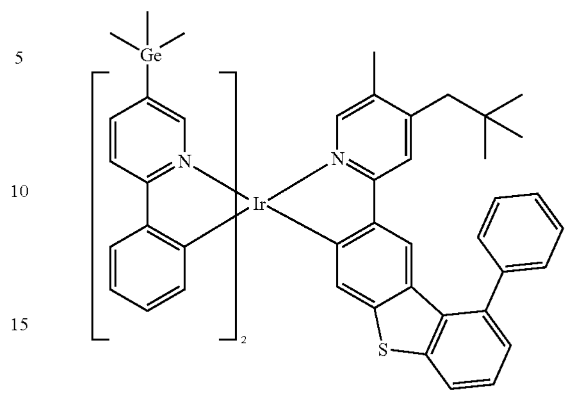
2118
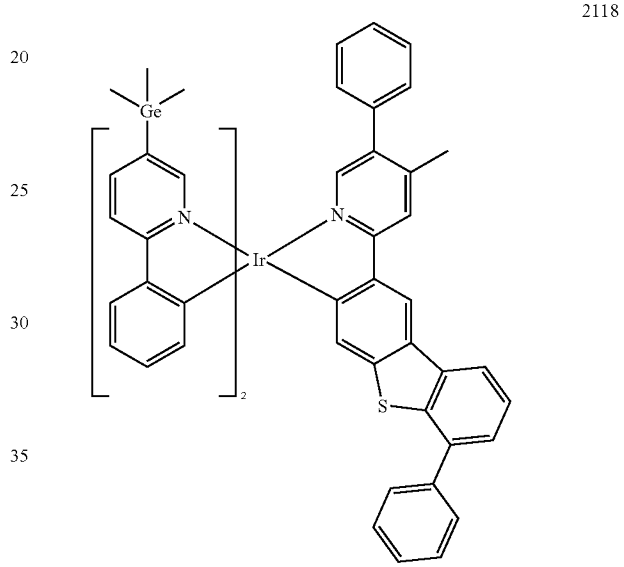
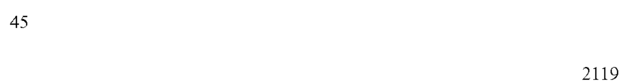
2119
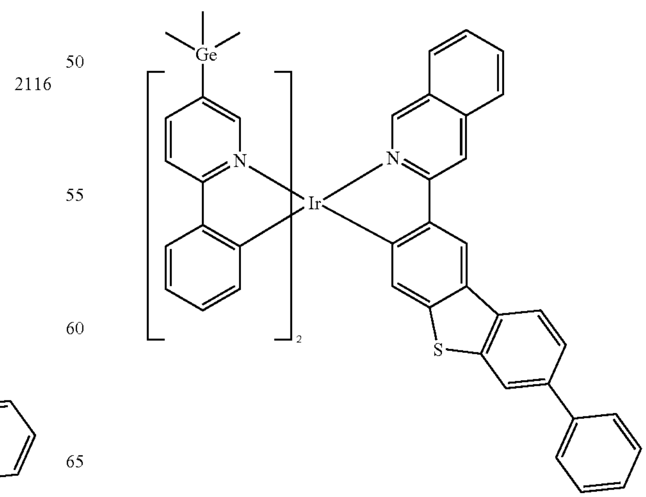

-continued
2120
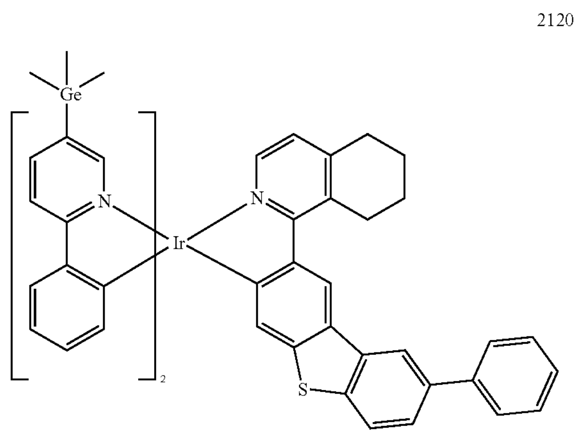
2121
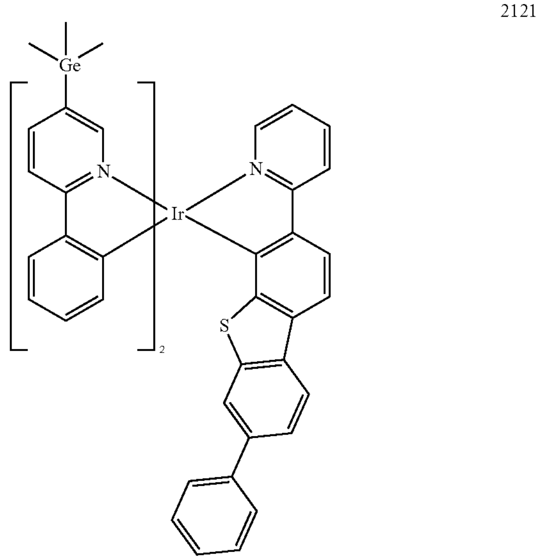
2122
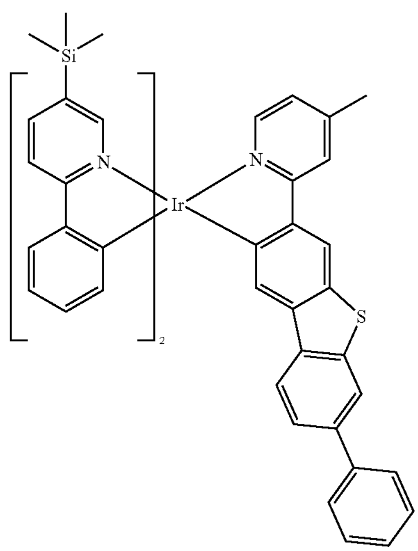
-continued
2123
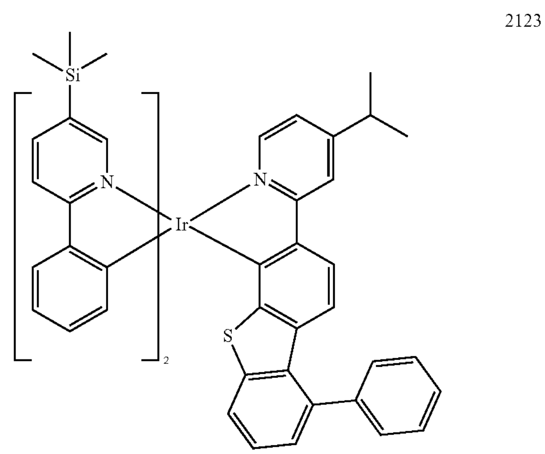
2124
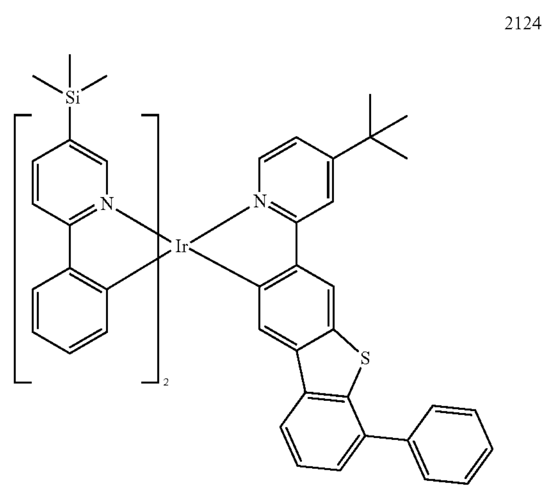
2125
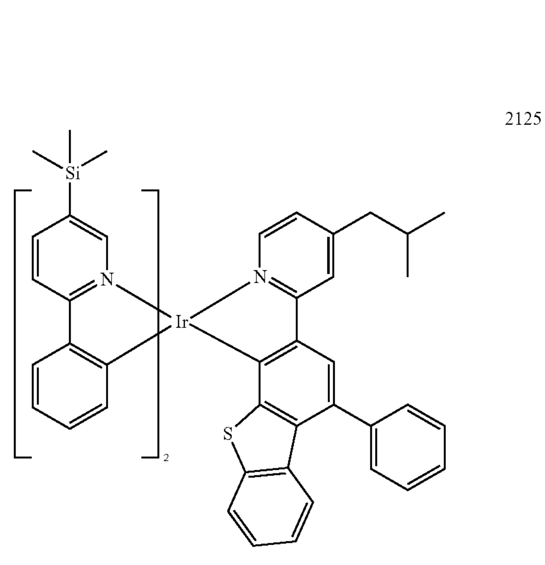

-continued
2126
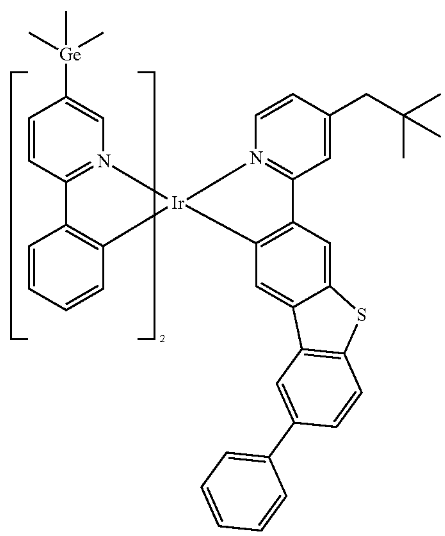
2127
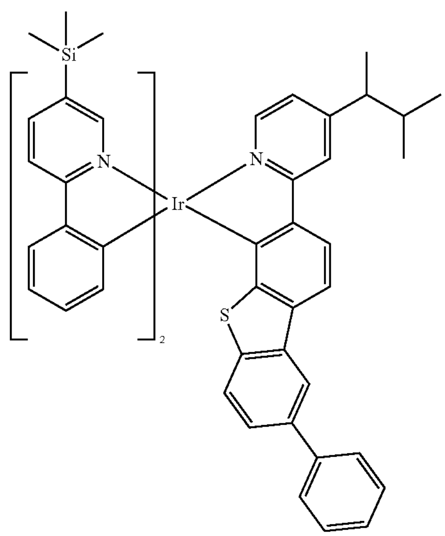
2128
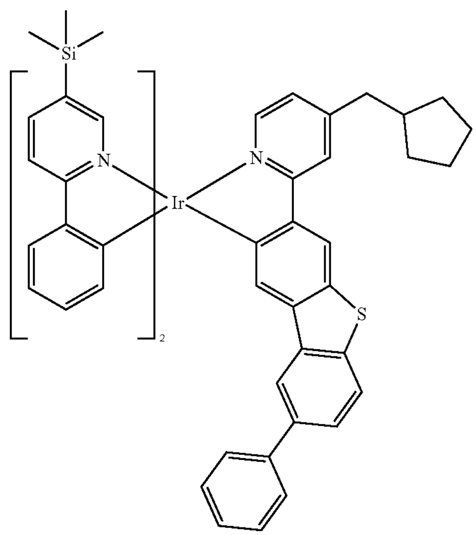
-continued
2129
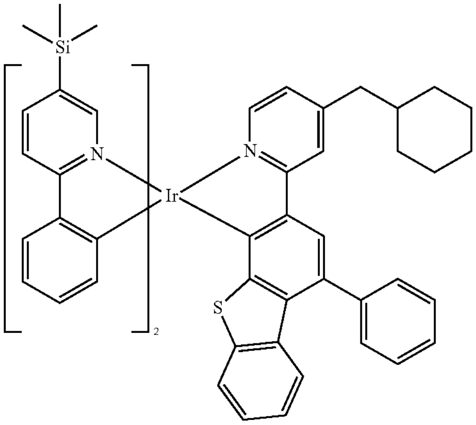
2130
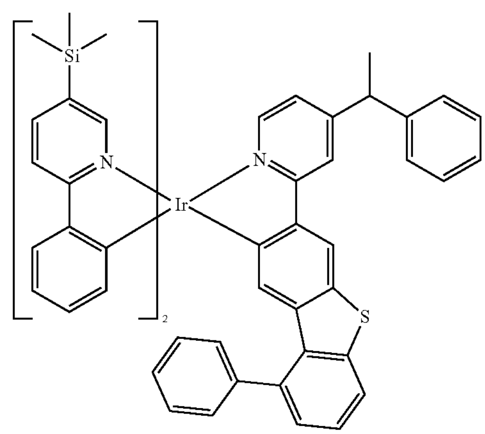
2131
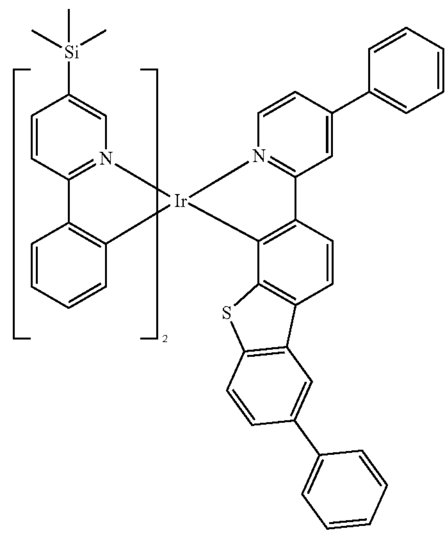

-continued
2132
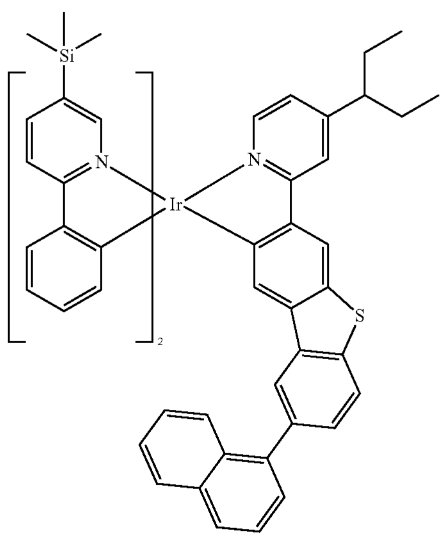
2133
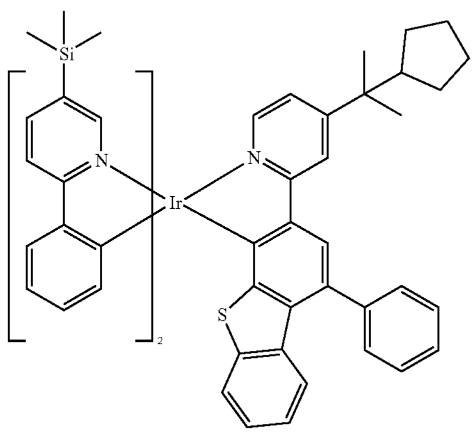
2134
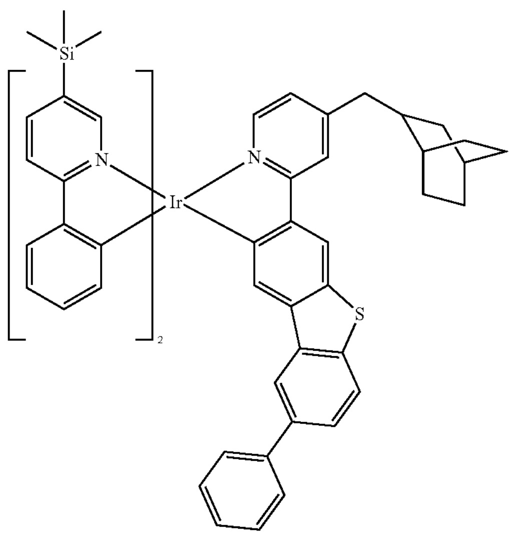
-continued
2135
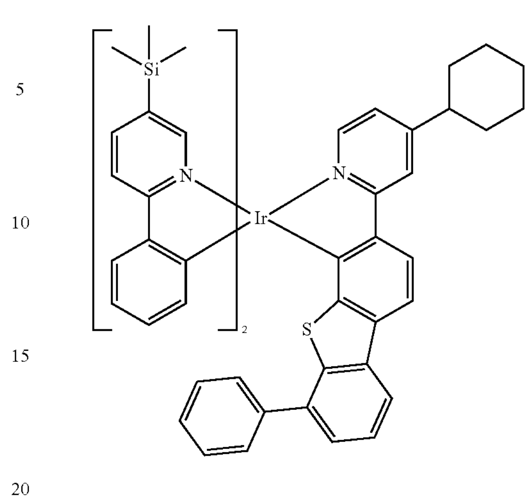
2136
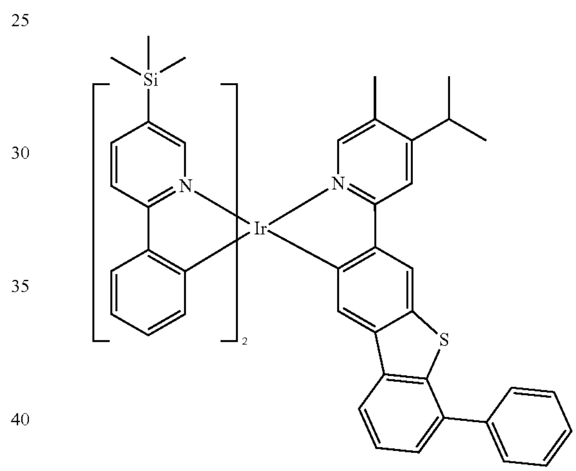
2137
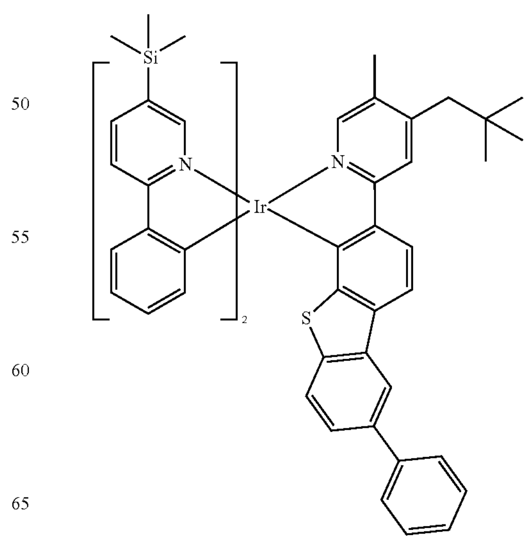

-continued
2137
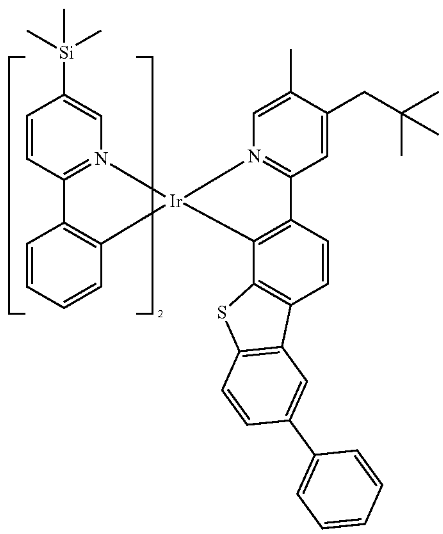
2138
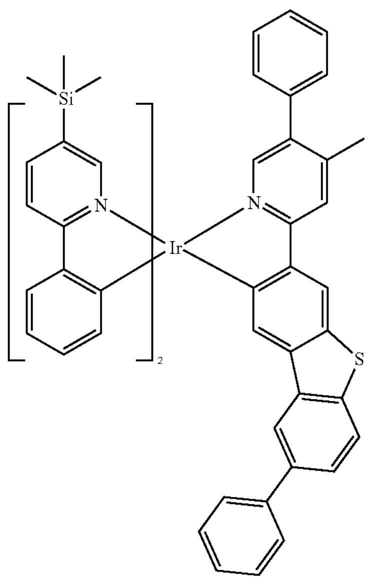
2139
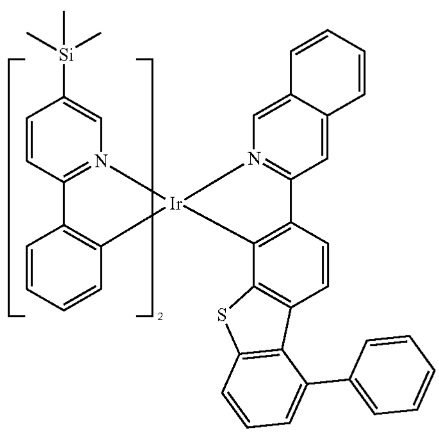
-continued
2140
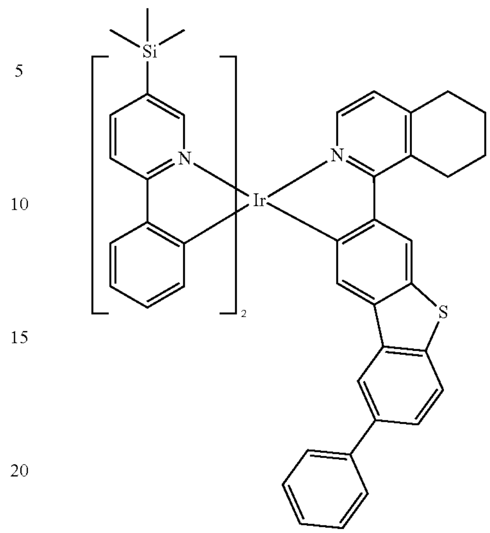
2141
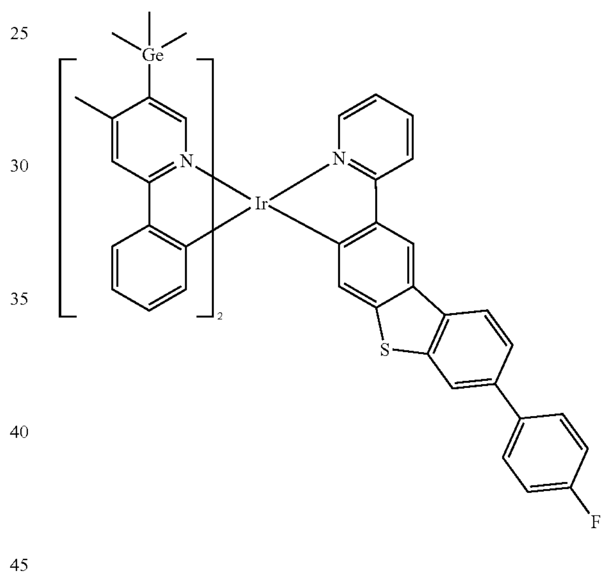
2142
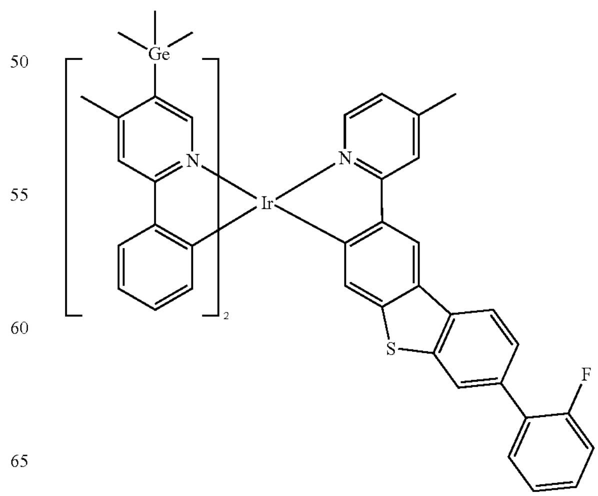

-continued
2143
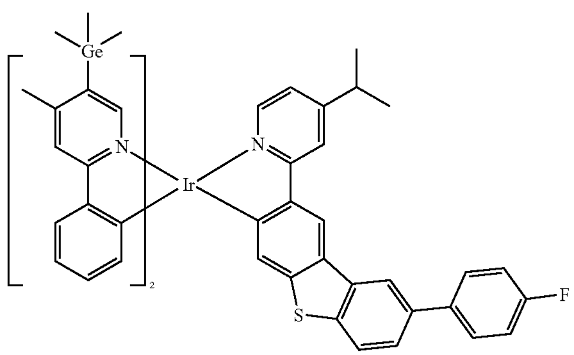
2144
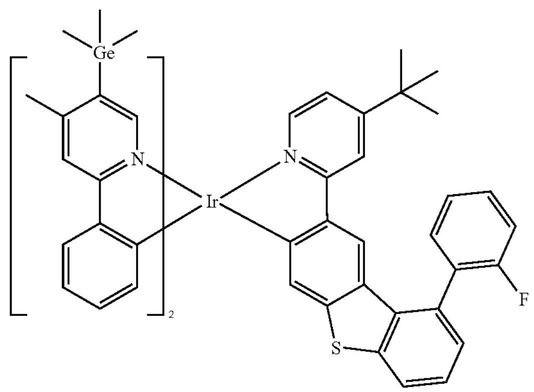
2145
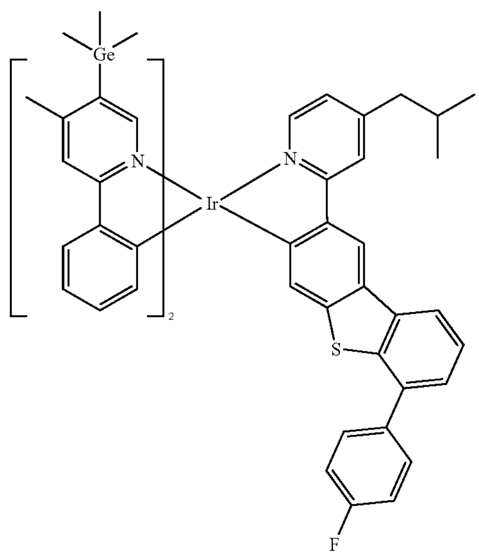
-continued
2146
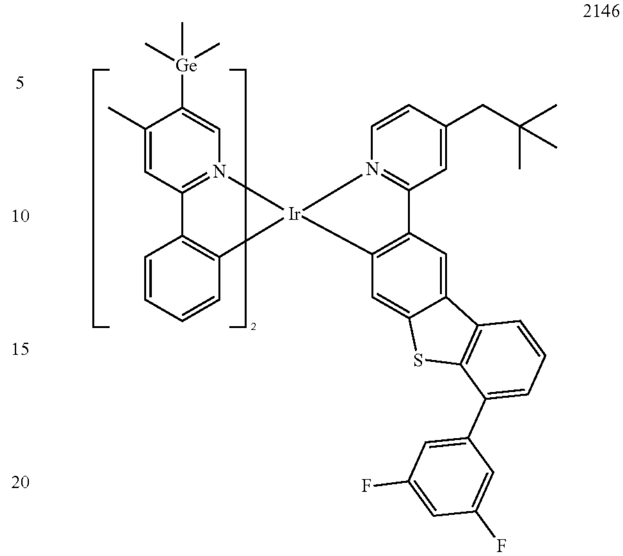
2147
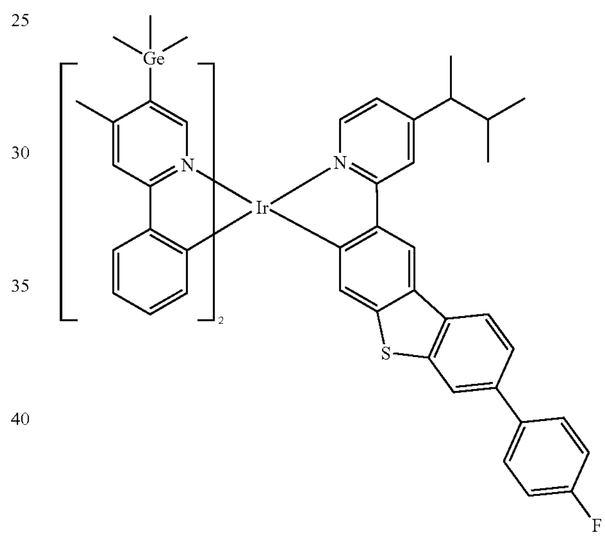
2148
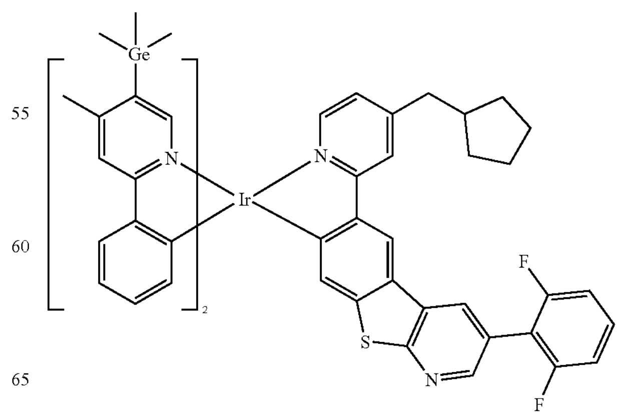

-continued
2149
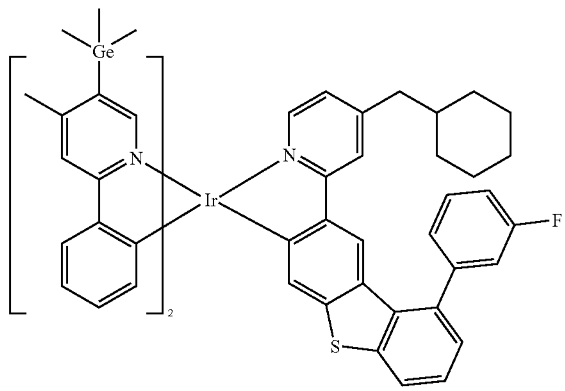
2150
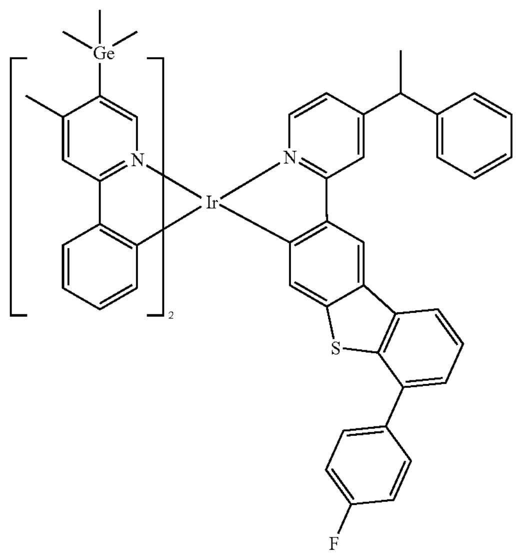
2151
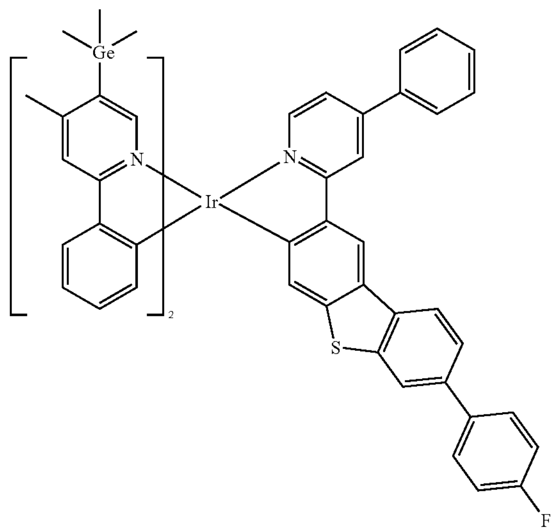
-continued
2152
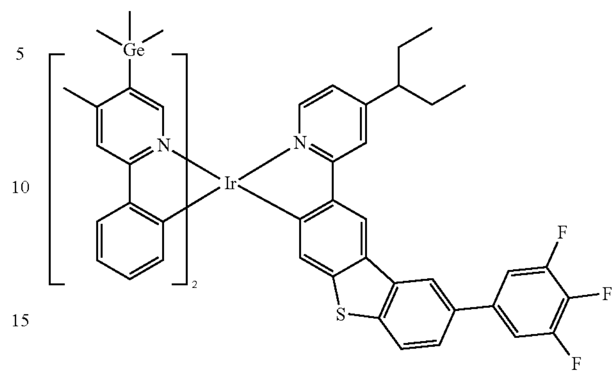
2153
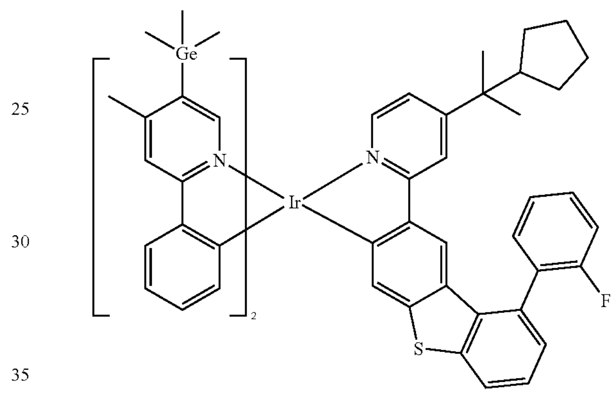
2154
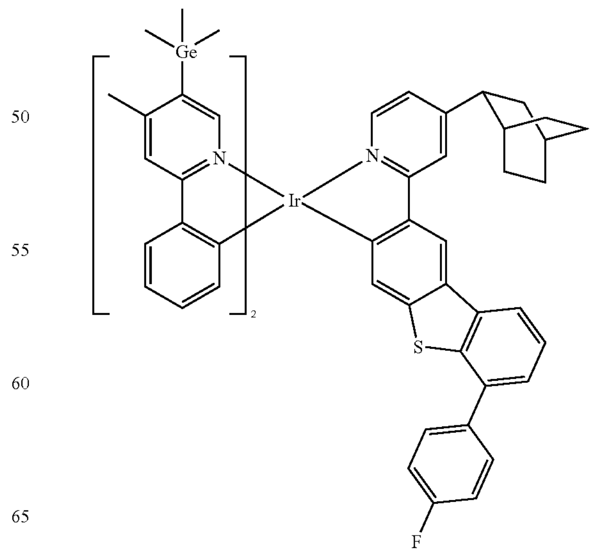

-continued
2156
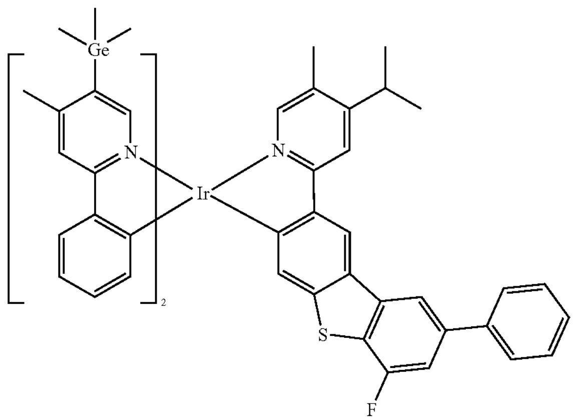
2157
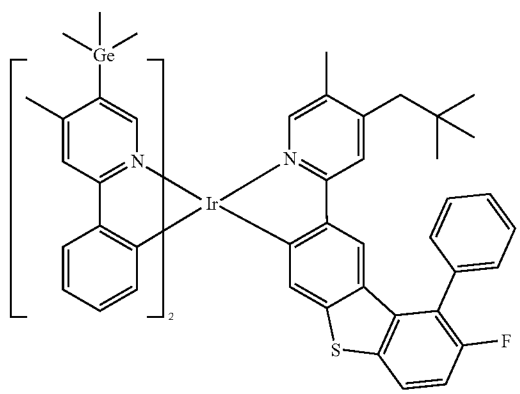
2158
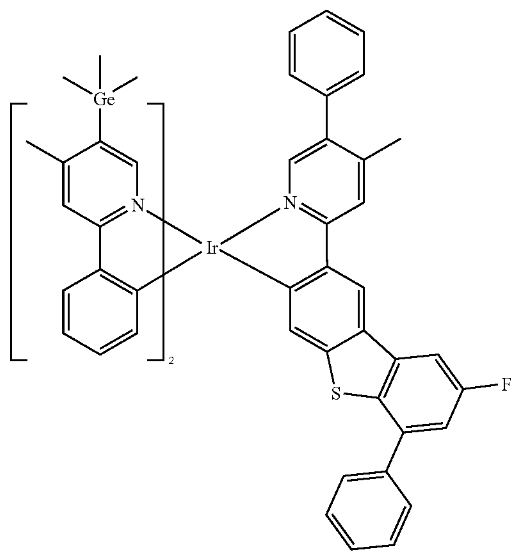
-continued
2159
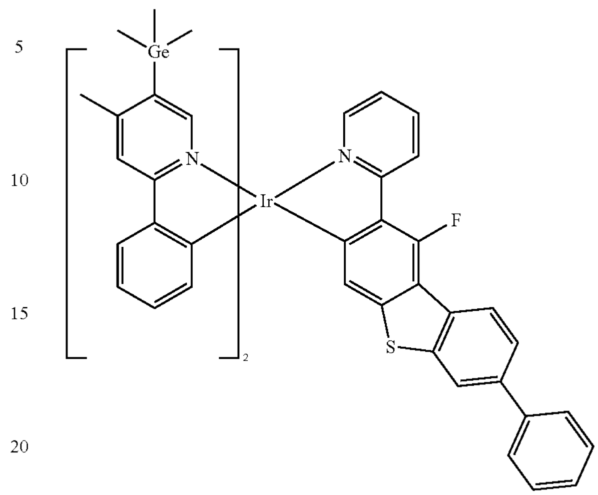
2160
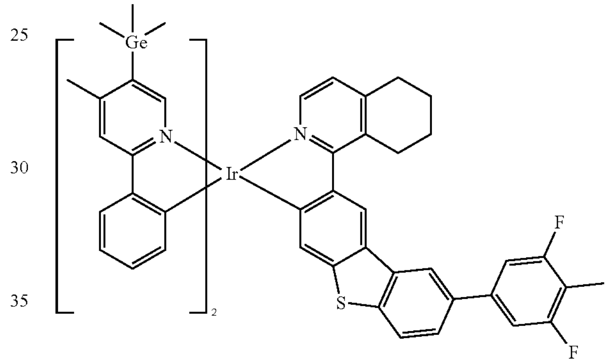
2161
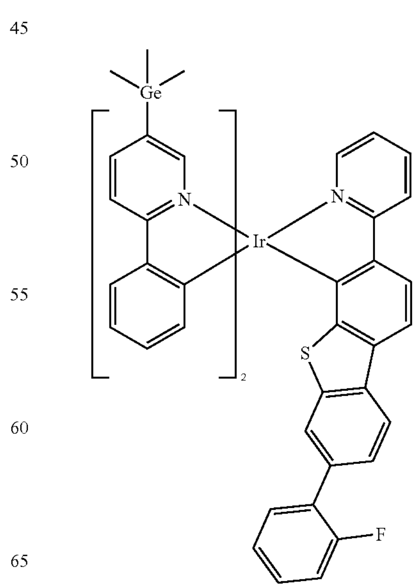

-continued
2162
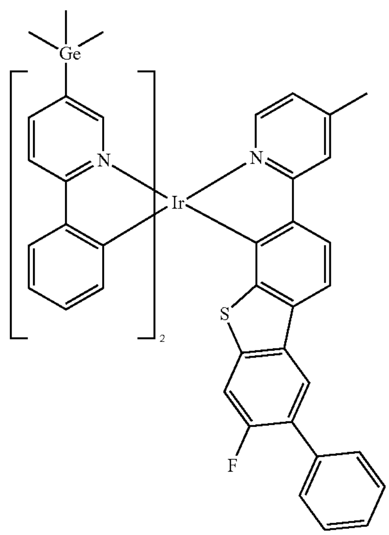
2163
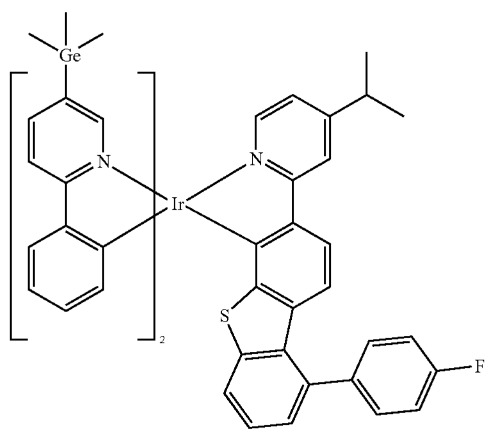
2164
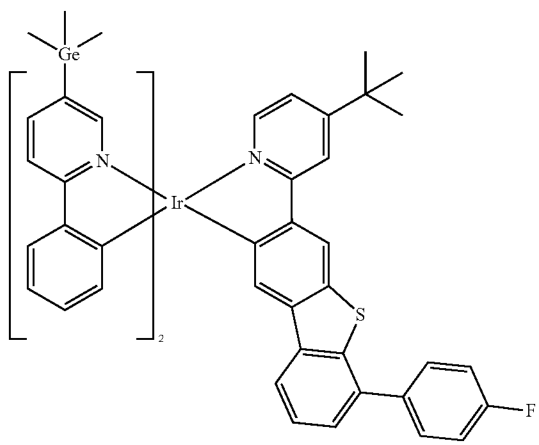
-continued
2165
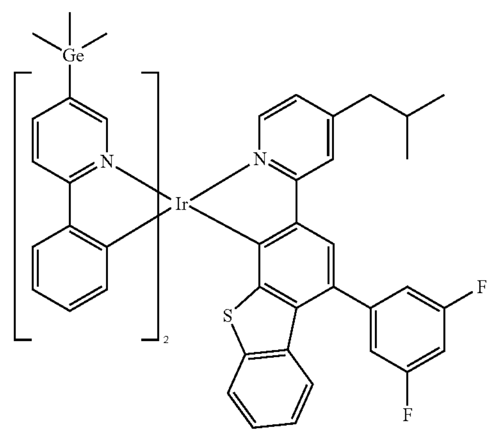
2166
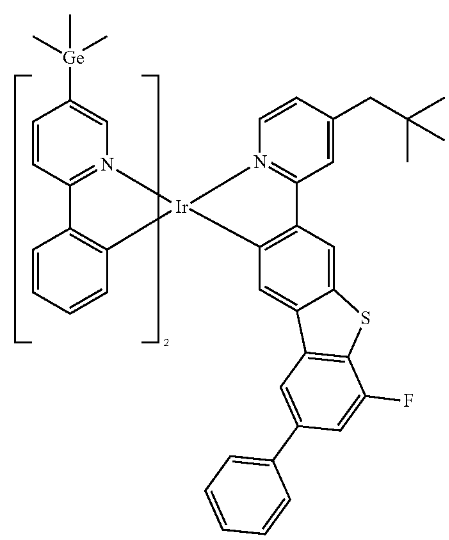
2167
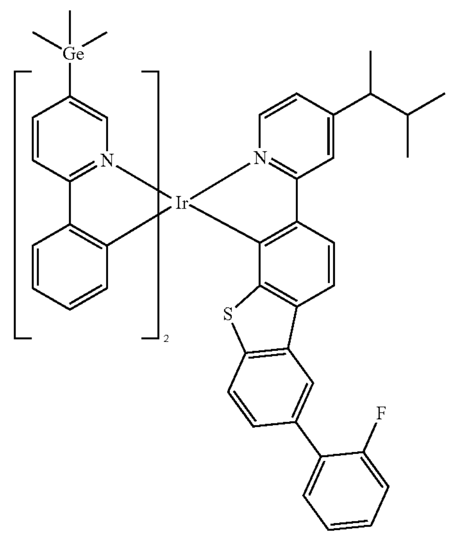

-continued
2168
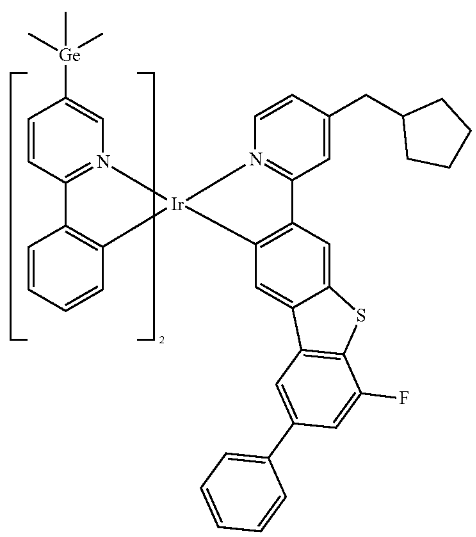
2169
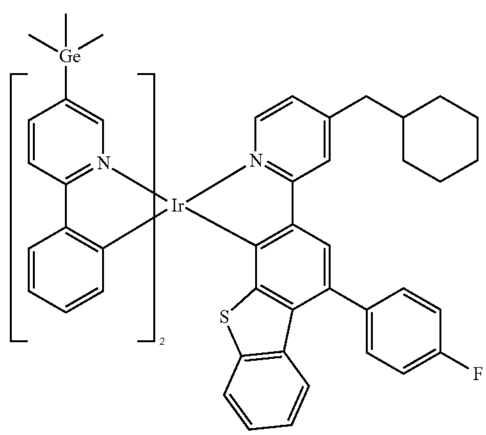
2170
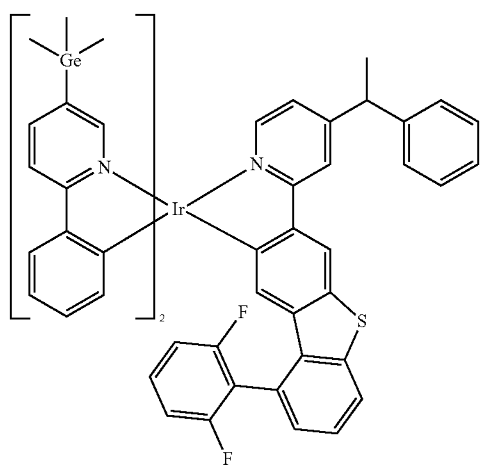
-continued
2171
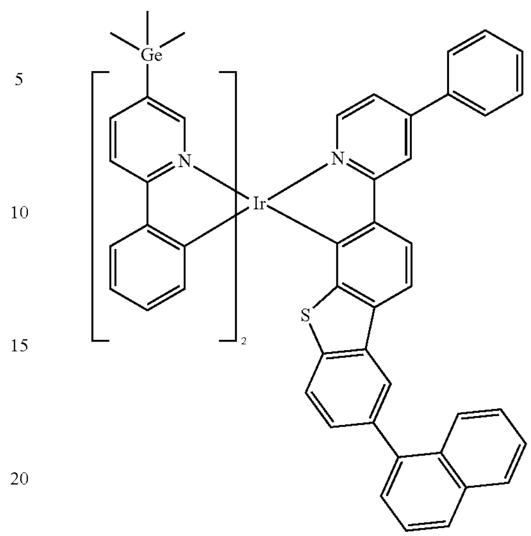
2172
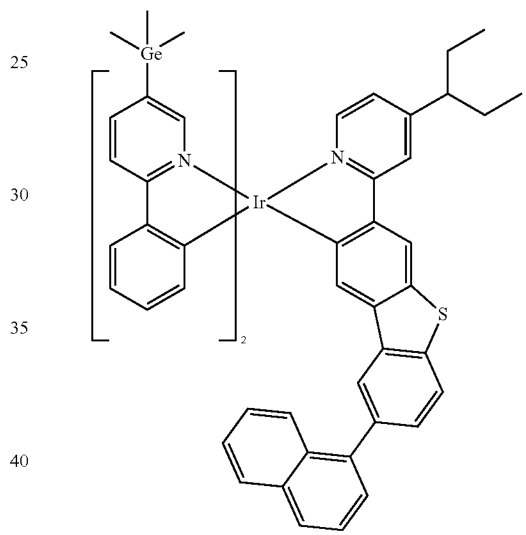
2173
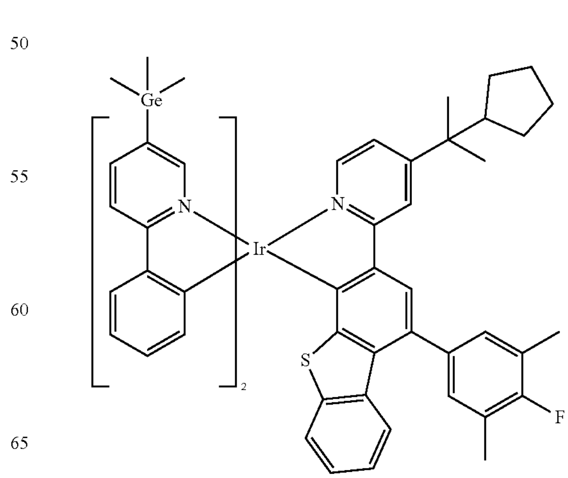

-continued
2174
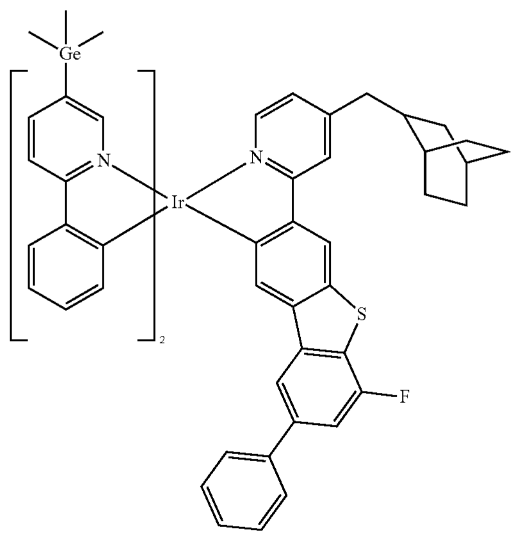
2175
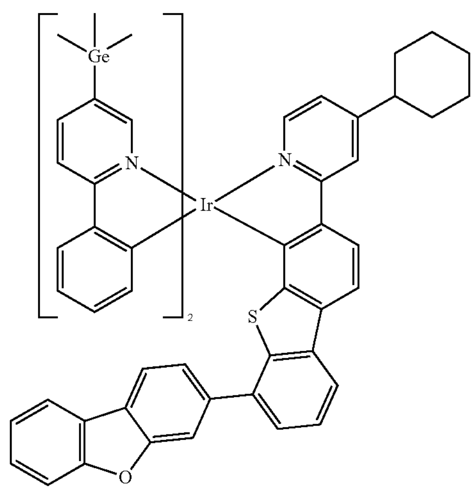
2176
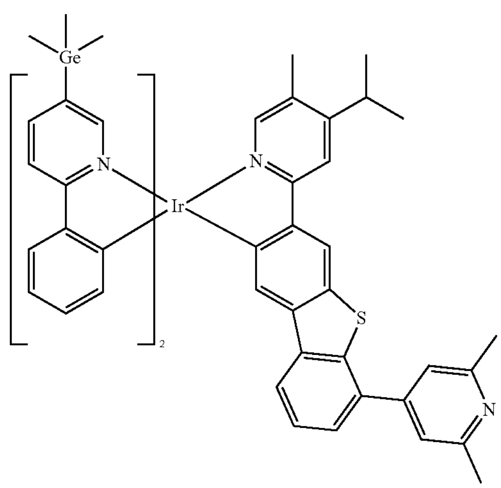
-continued
2177
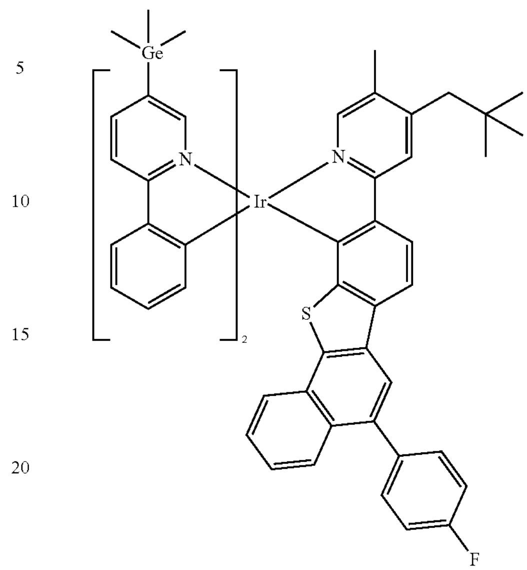
2178
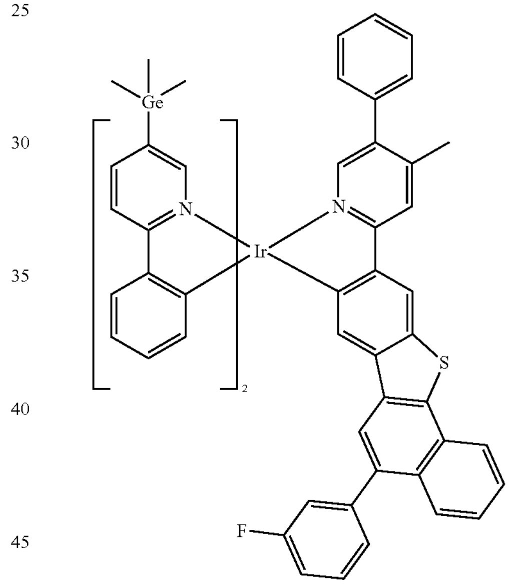
2179
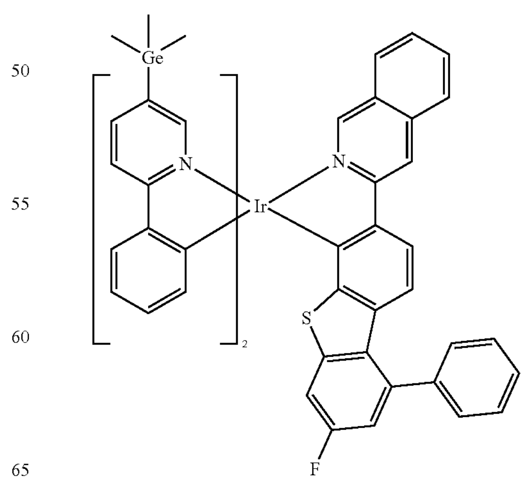

-continued
2180
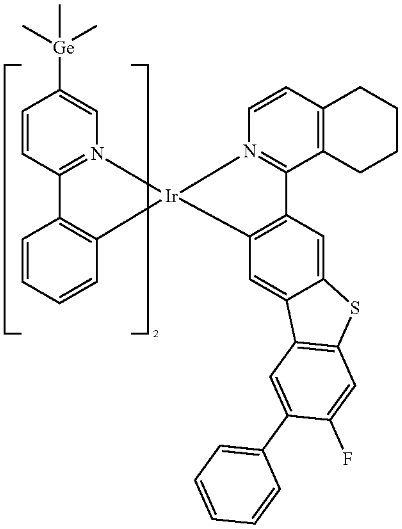
2181
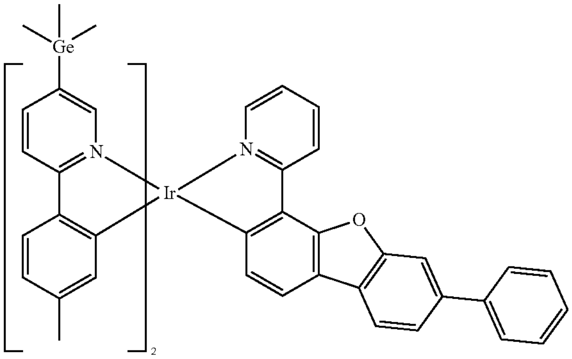
2182
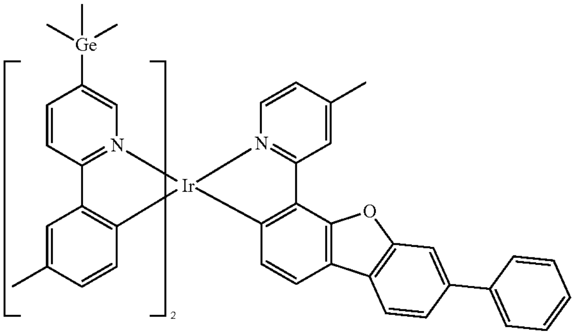
2183
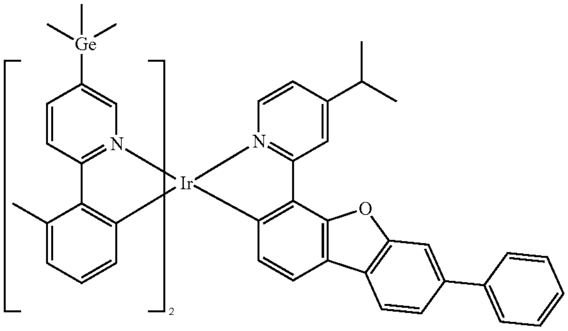
-continued
2184
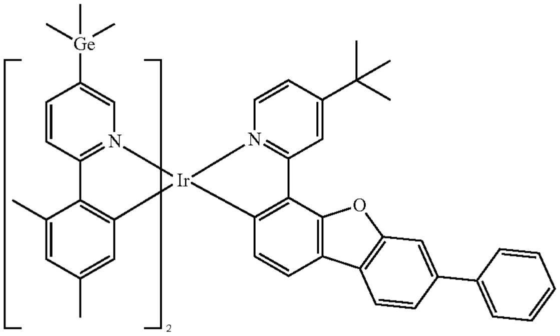
2185
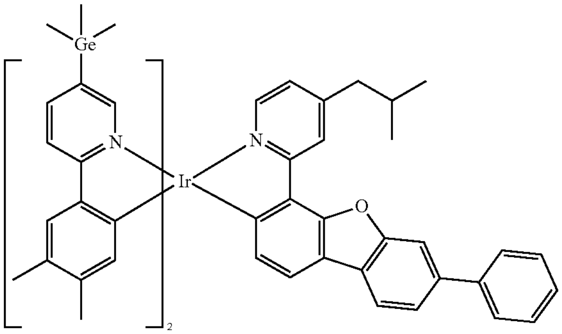
2186
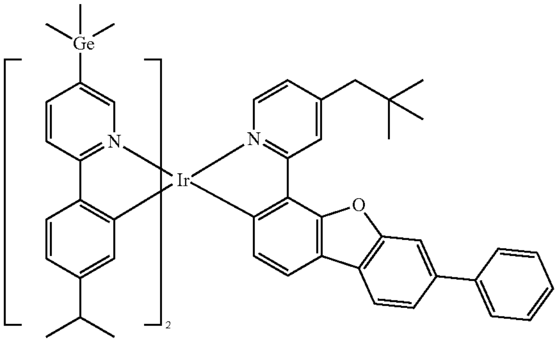
2187
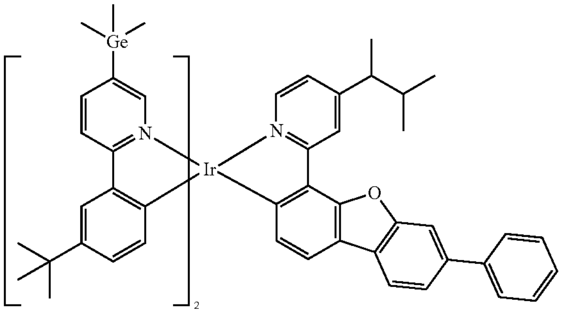

-continued
2187
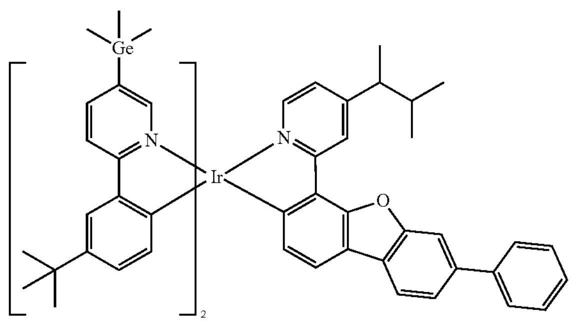
2188
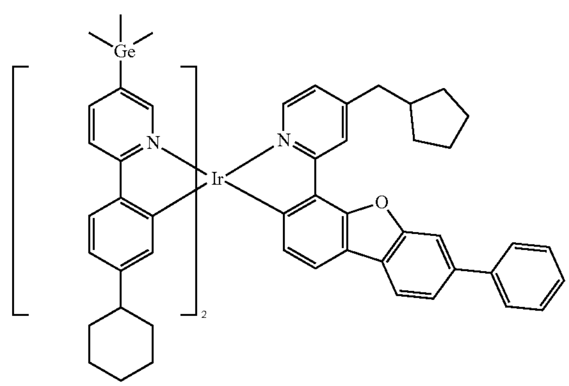
2189
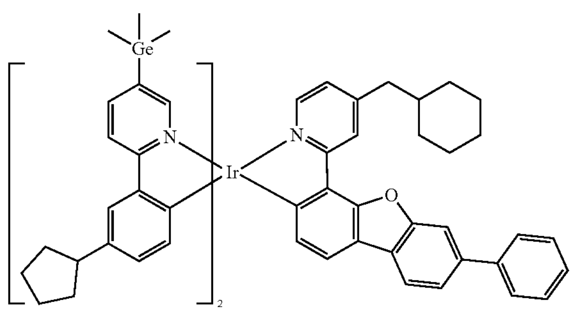
2190
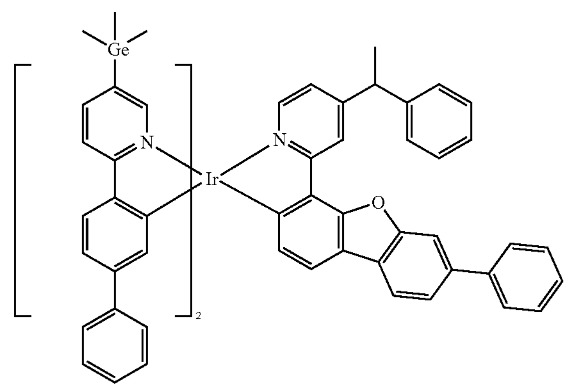
-continued
2191
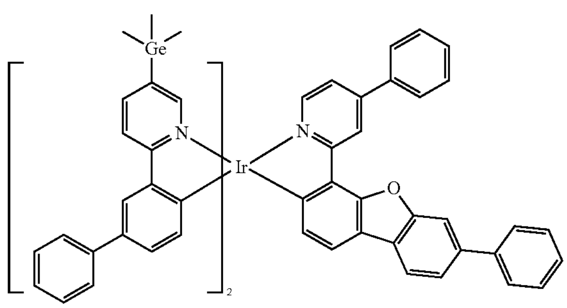
2192
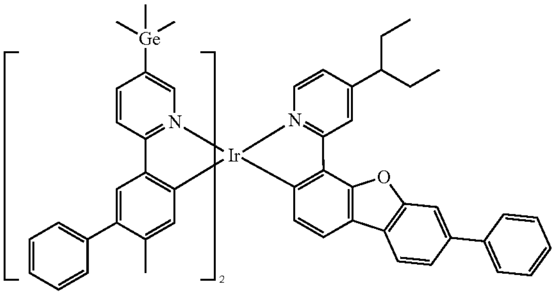
2193
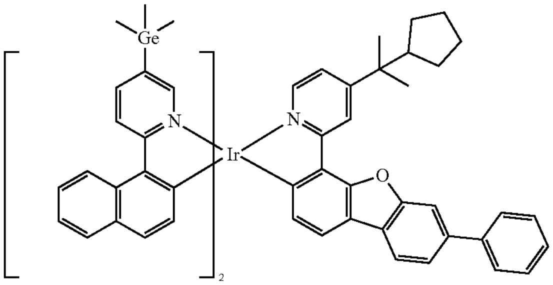
2194
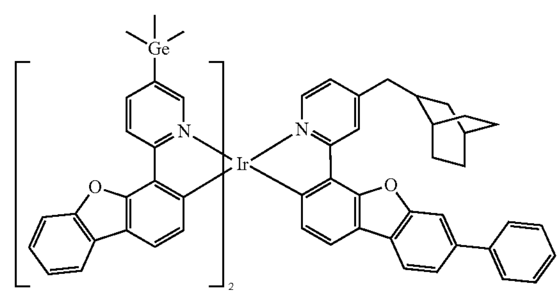

-continued
2195
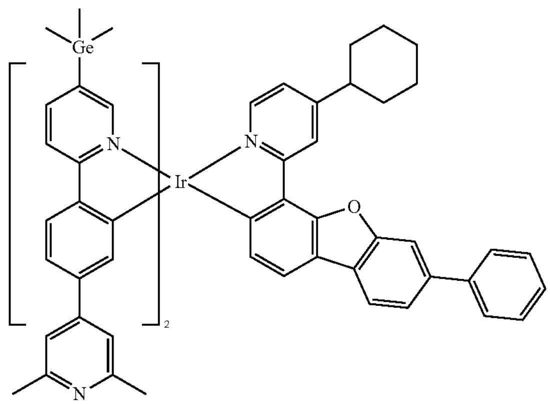
2196
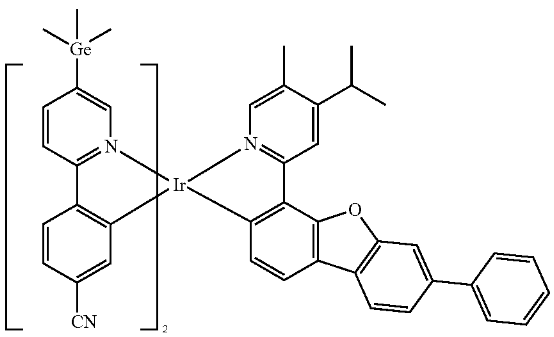
2197
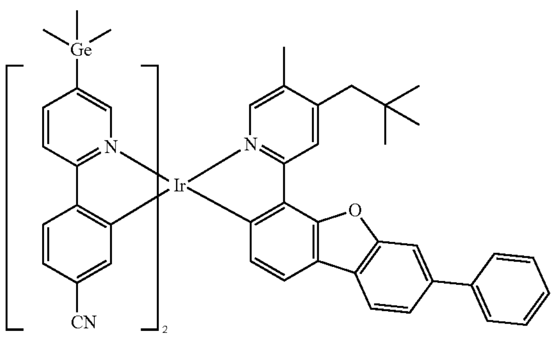
2198
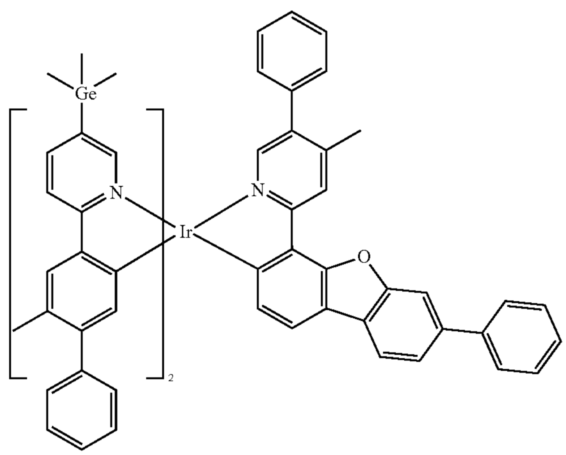
-continued
2199
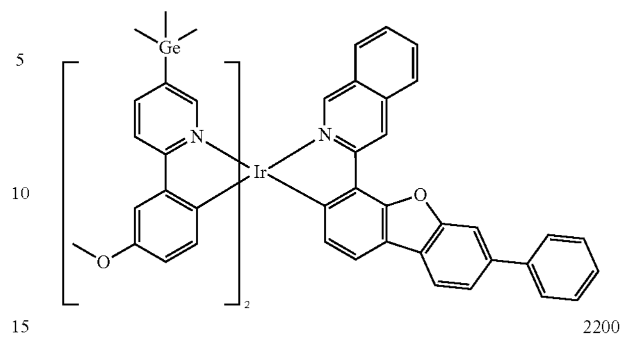
2200
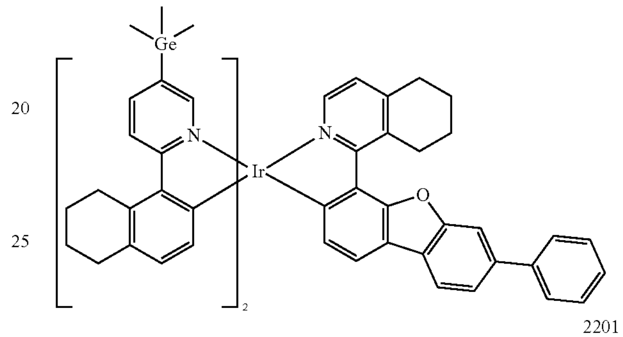
2201
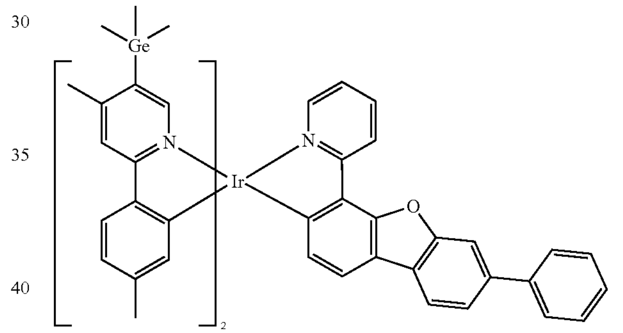
2202
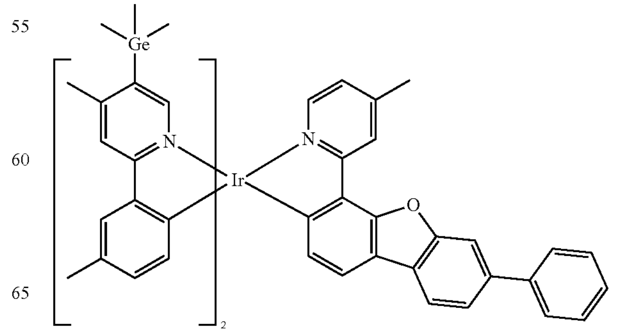

-continued
2203
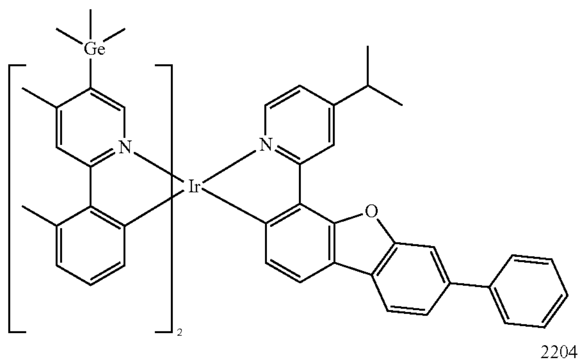
2204
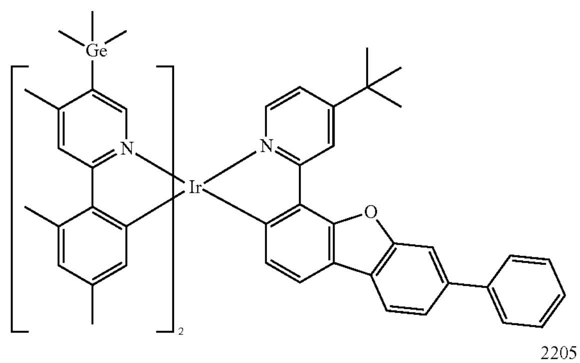
2205
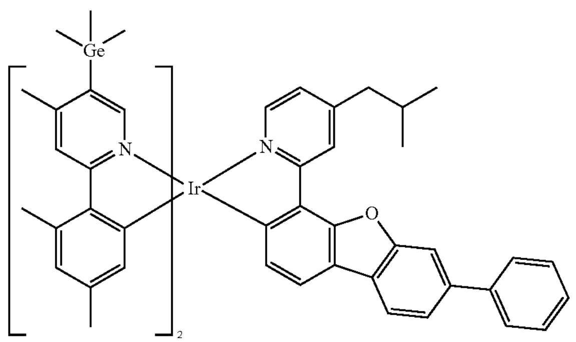
2206
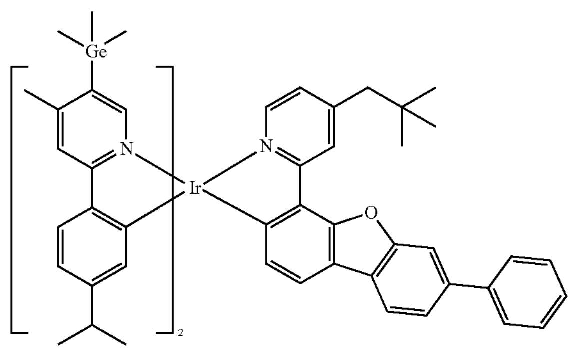
-continued
2207
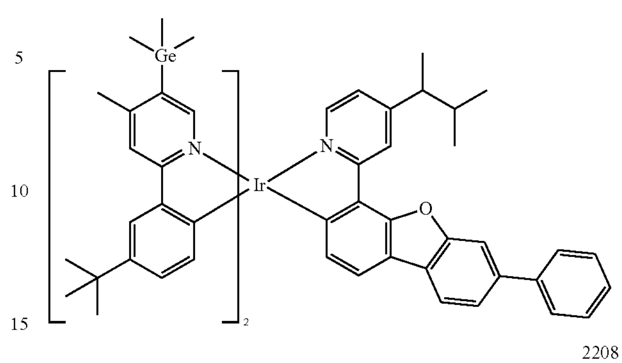
2208
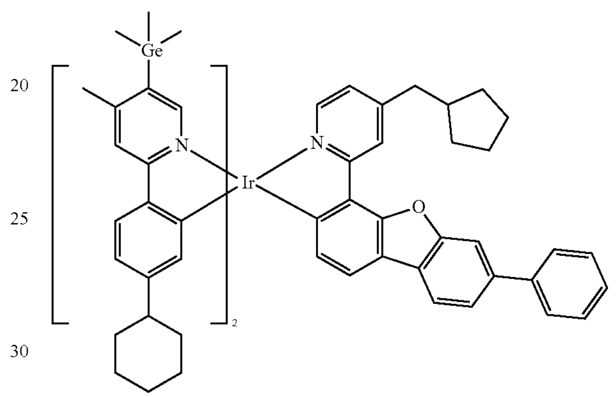
2209
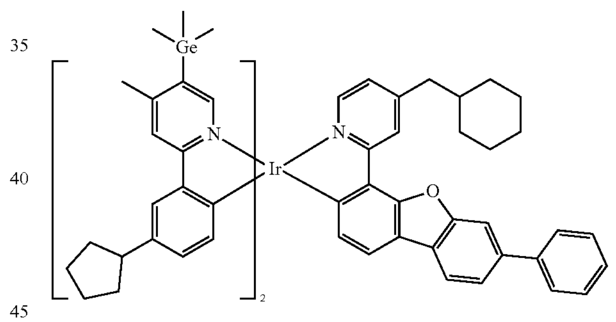
2210
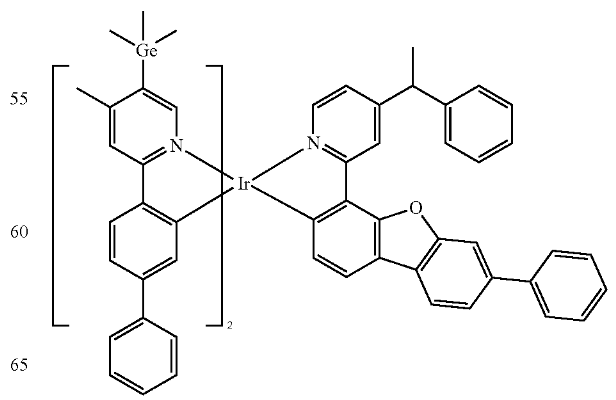

-continued
2211
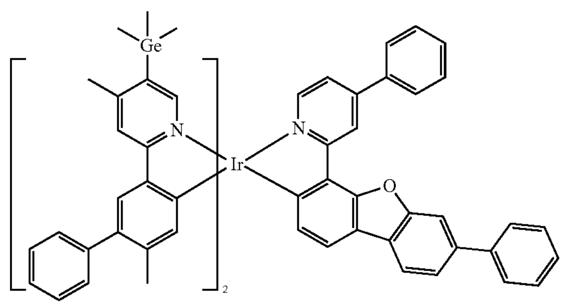
2212
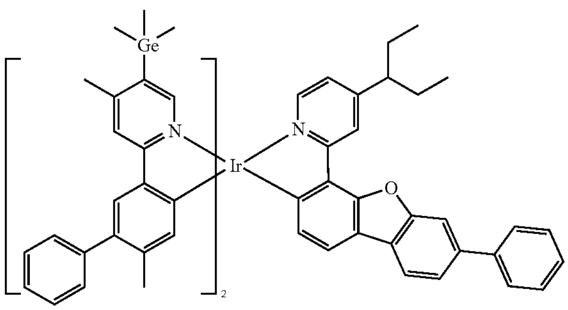
2213
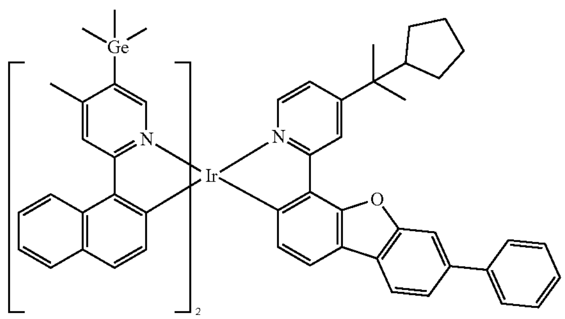
2214
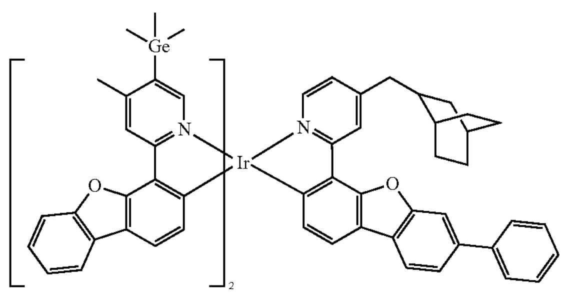
-continued
2215
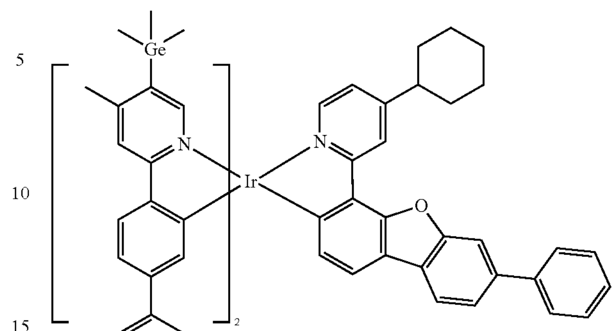
2216
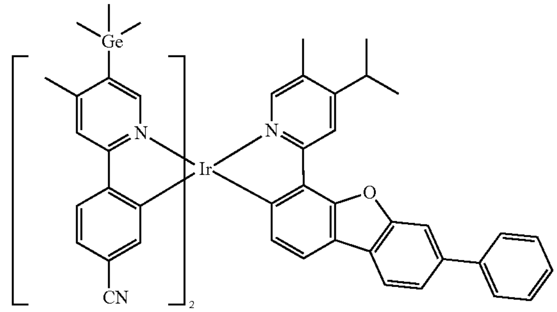
2217
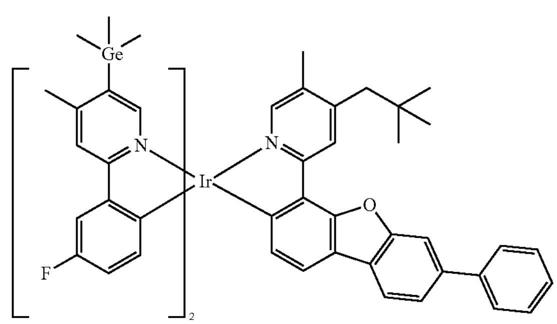
2218
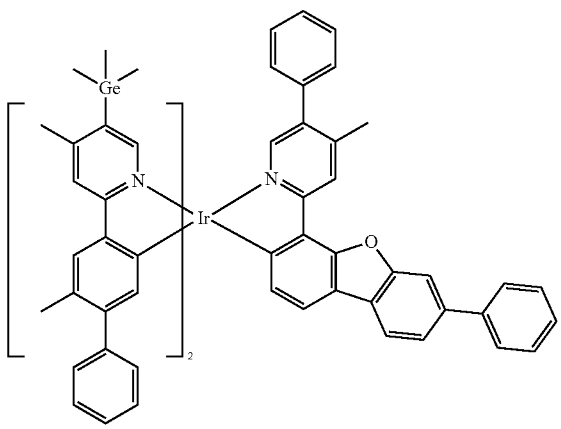

-continued
2219
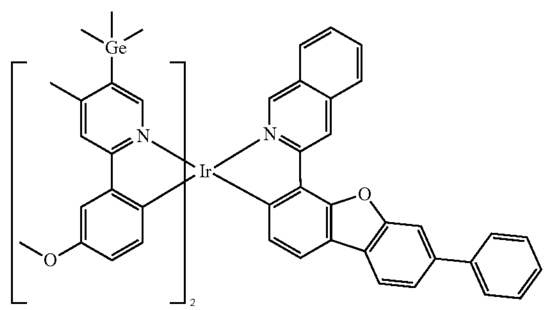
2220
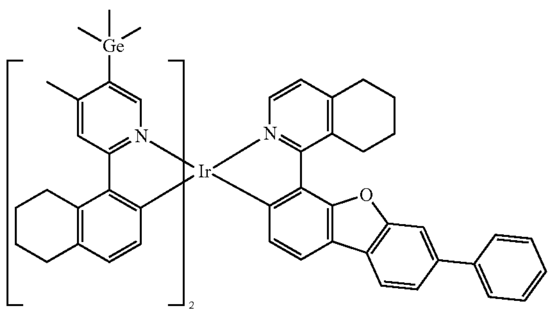
2221
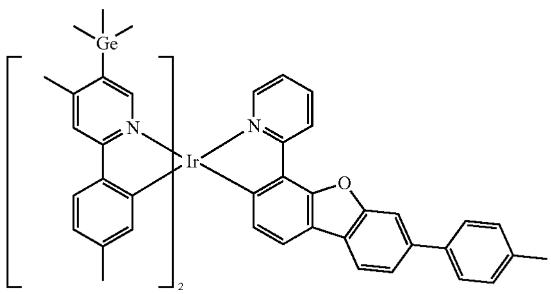
2222
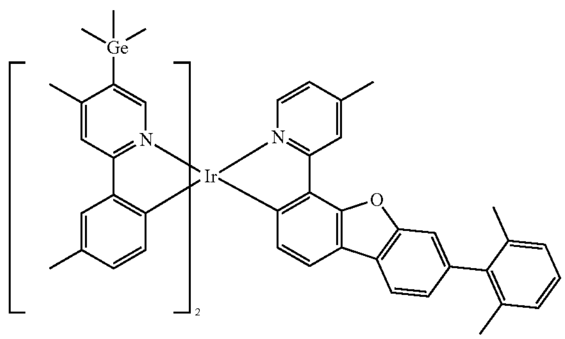
-continued
2223
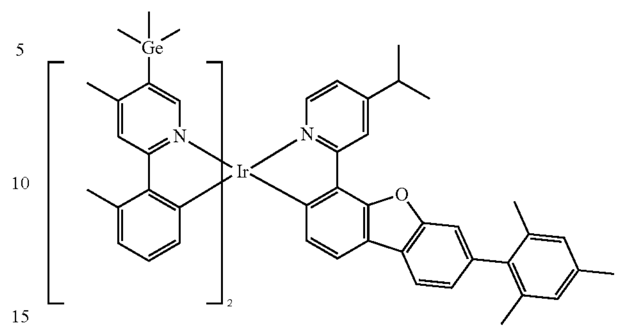
2224
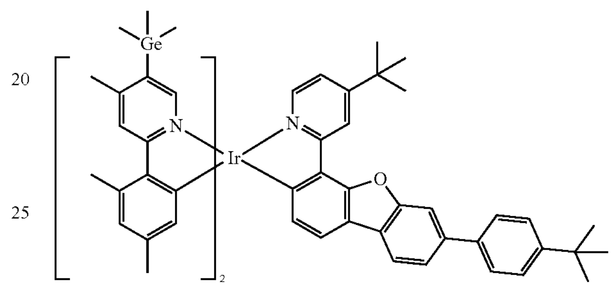
2225
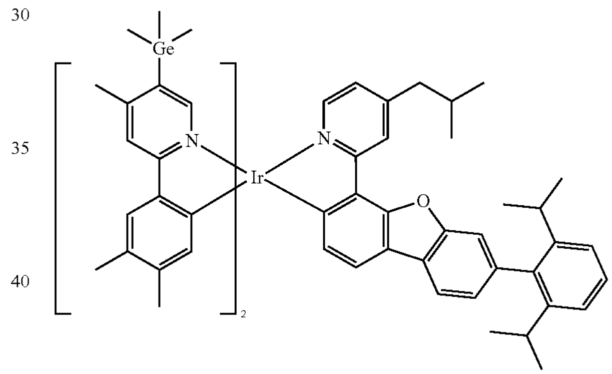
2226
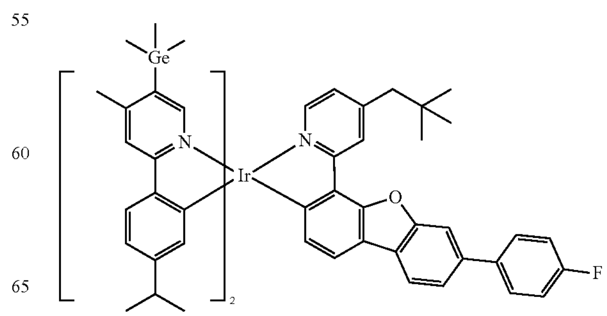

-continued
2227
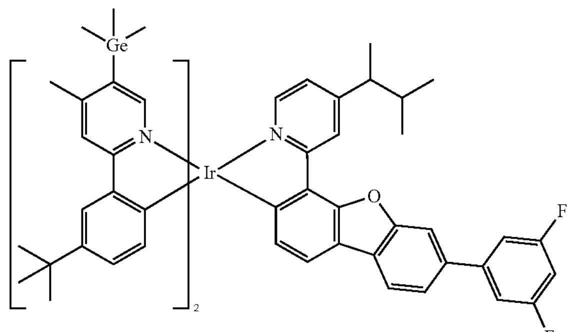
2228
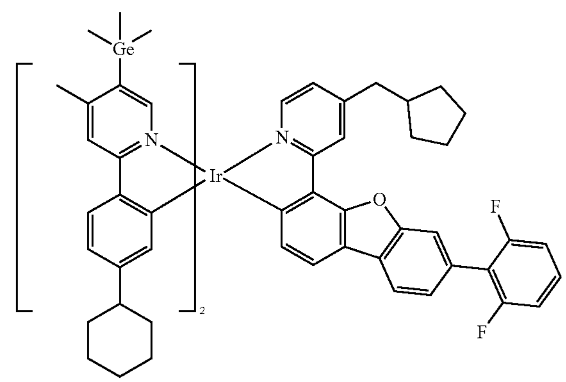
2229
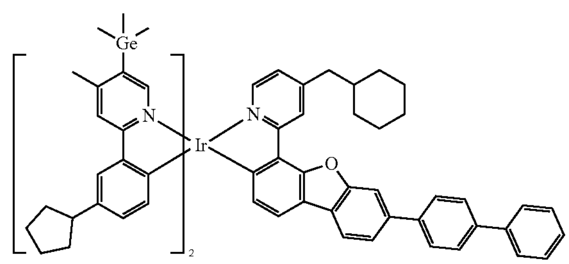
2230
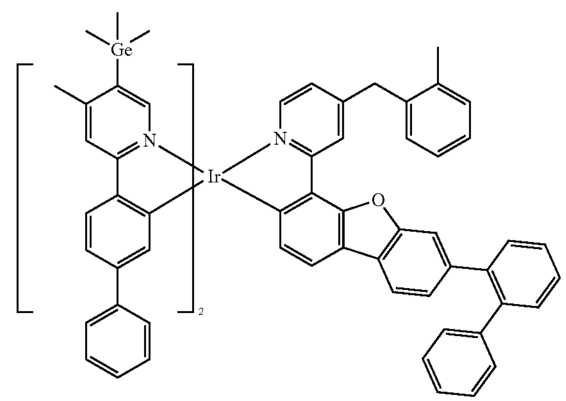
-continued
2231
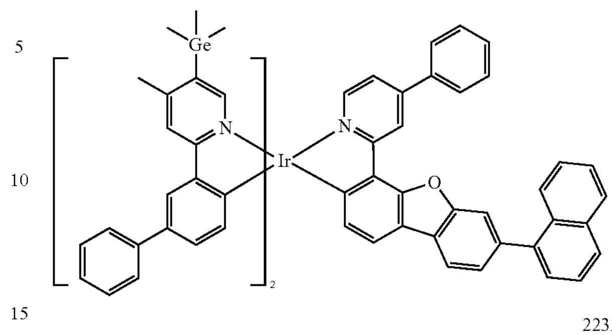
2232
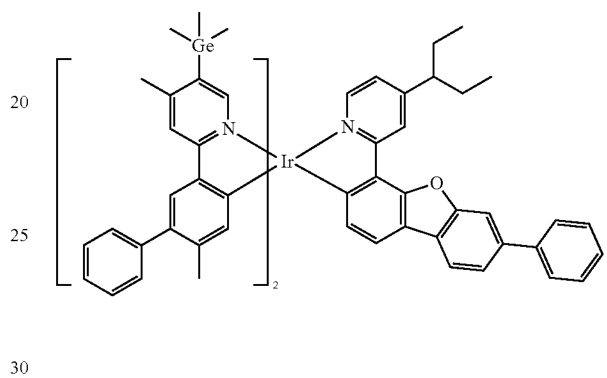
2233
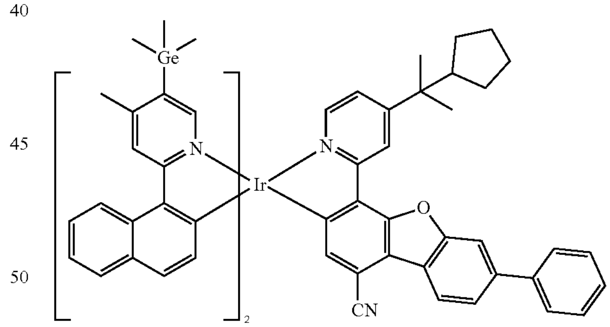
2234
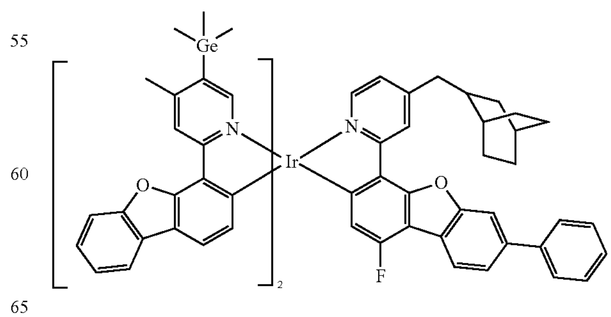

-continued
2235
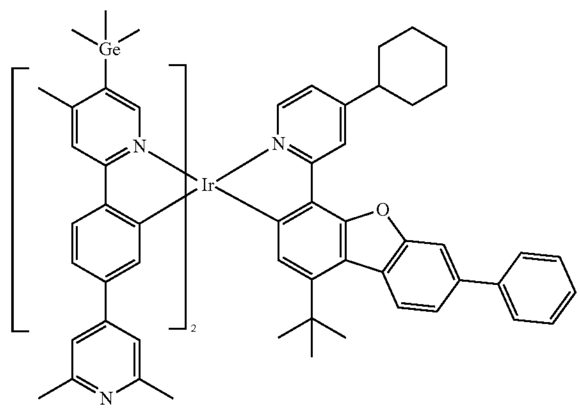
2236
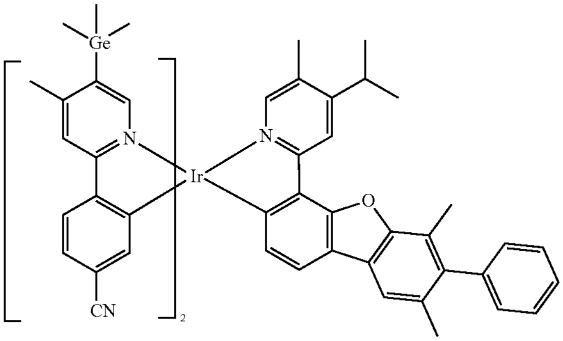
2237
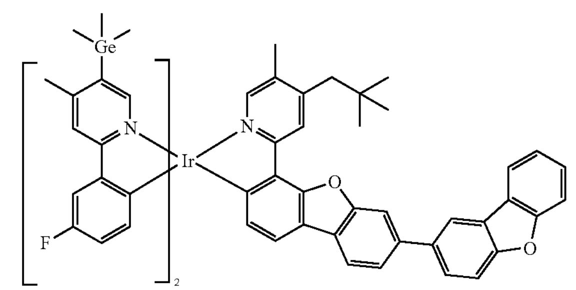
2238
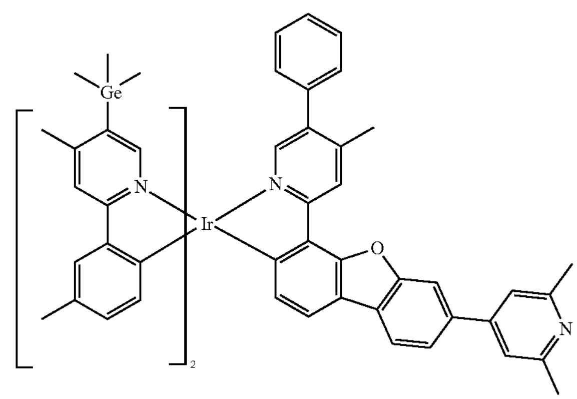
-continued
2239
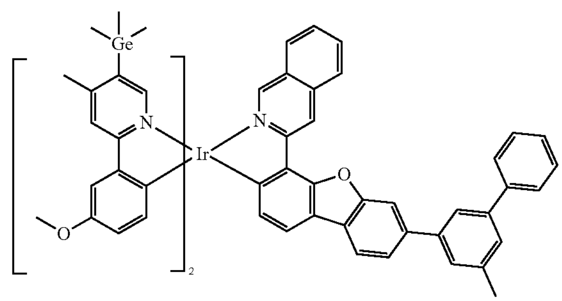
2240
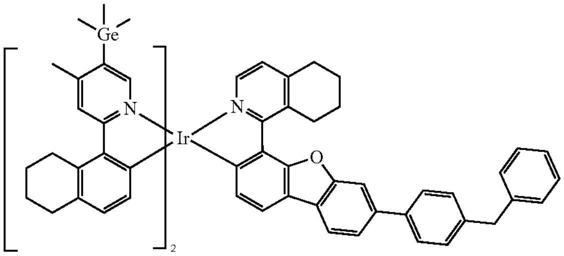
2241
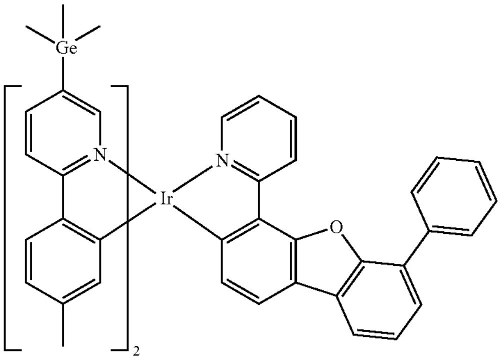
2242
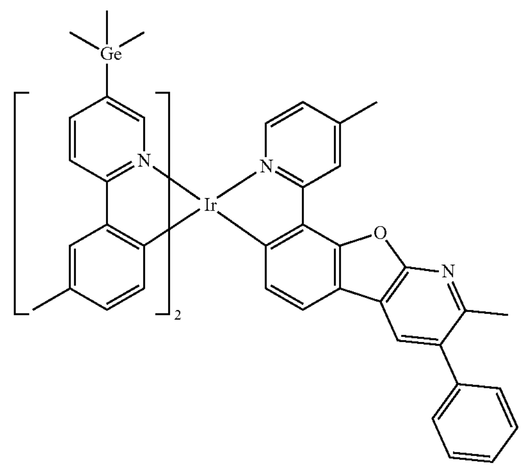

-continued
2243
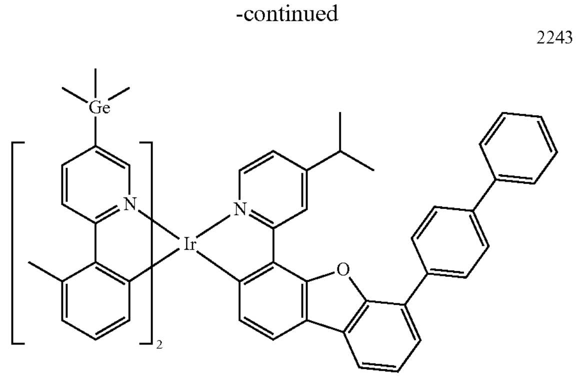
2249
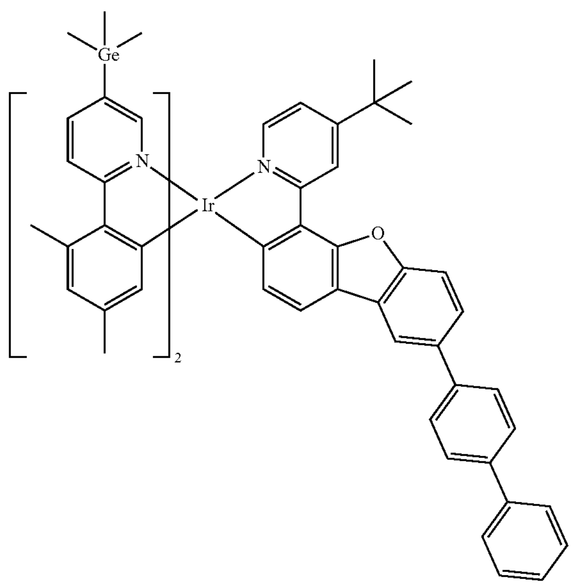
2250
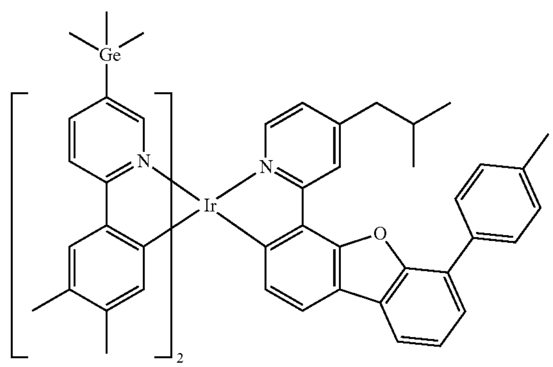
-continued
2251
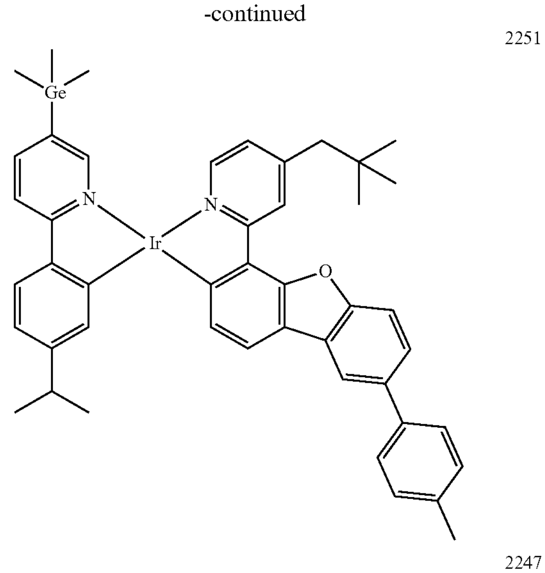
2247
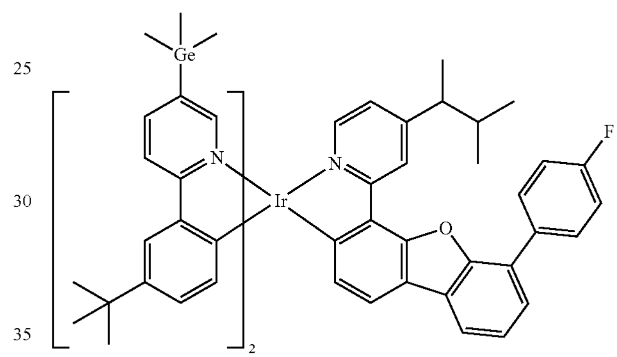
2248
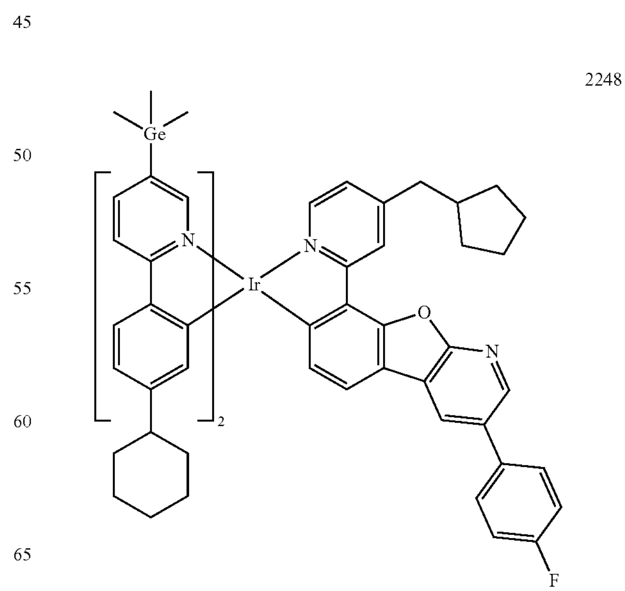

-continued
2249
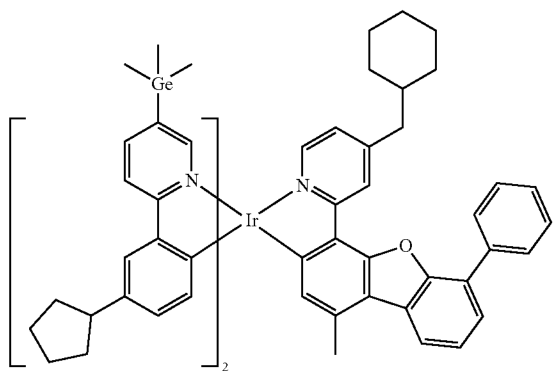
2250
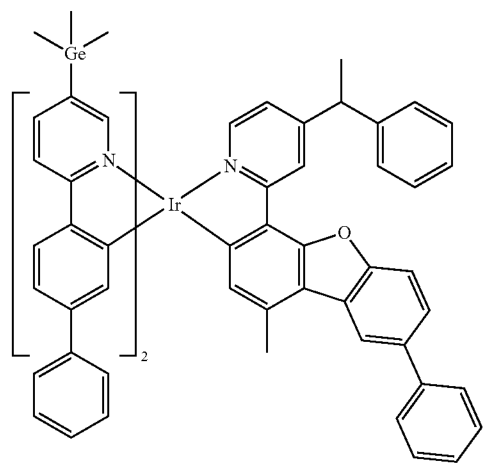
2251
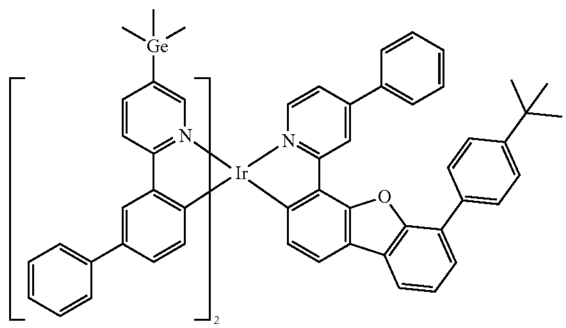
2252
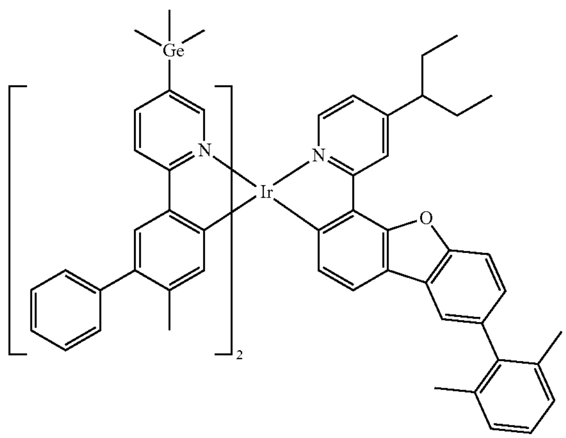
-continued
2253
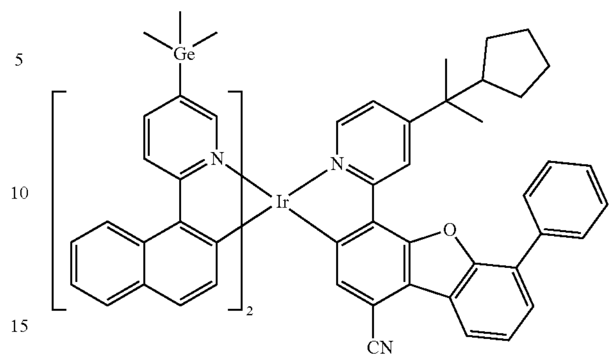
2254
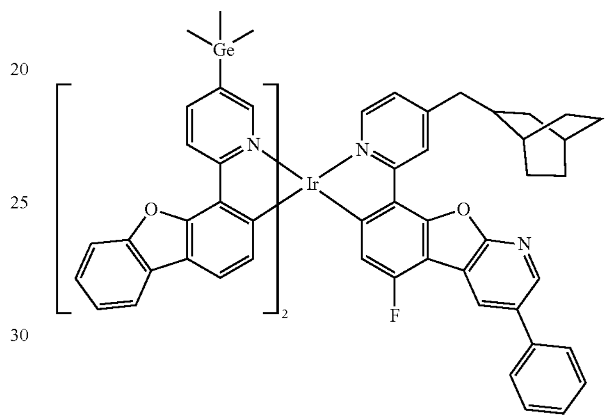
2255
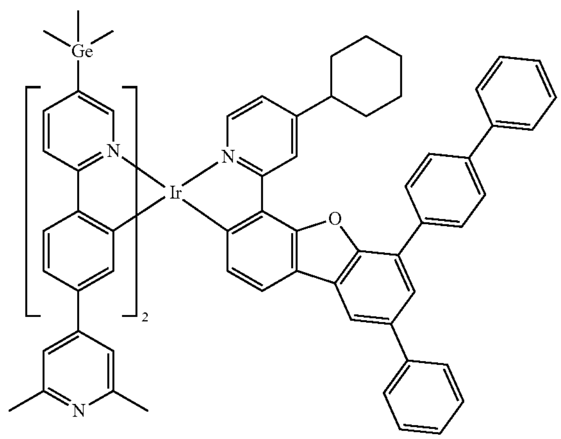

-continued
2256
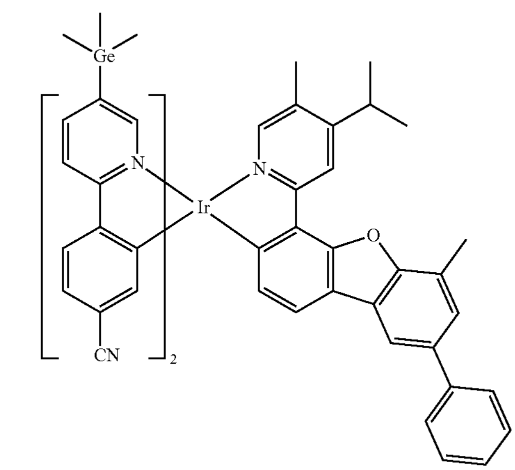
2257
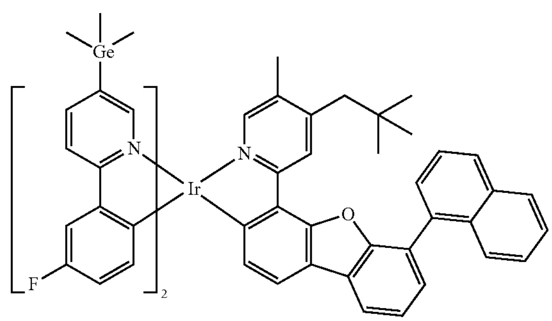
2258
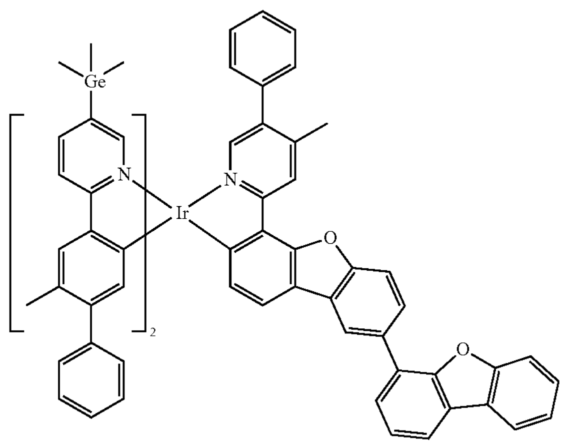
2259
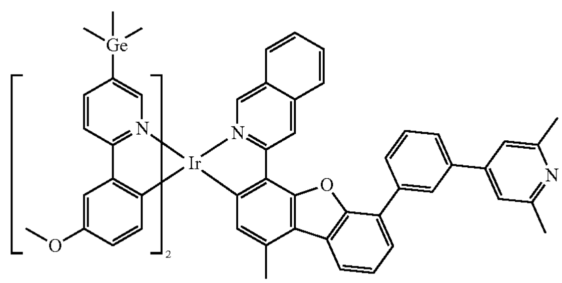
-continued
2260
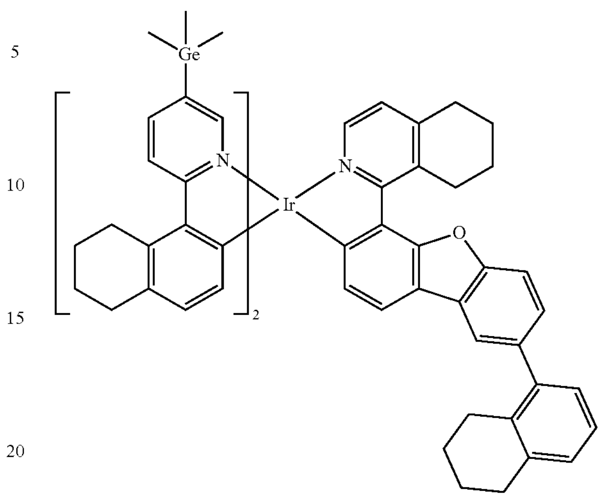
2261
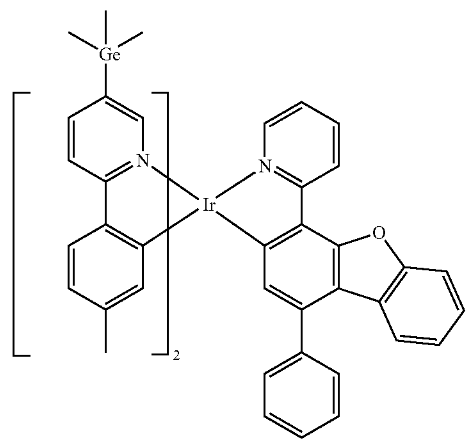
2263
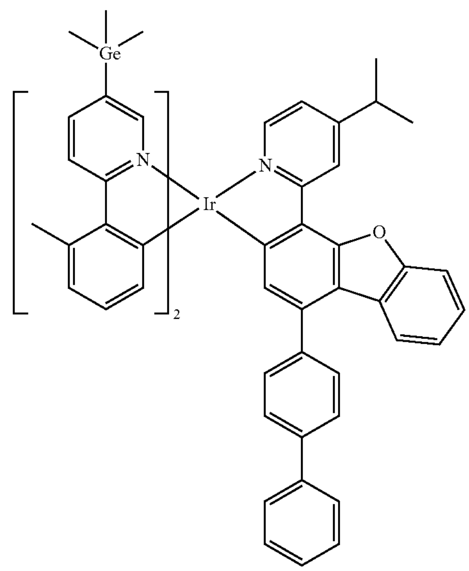

-continued
2264
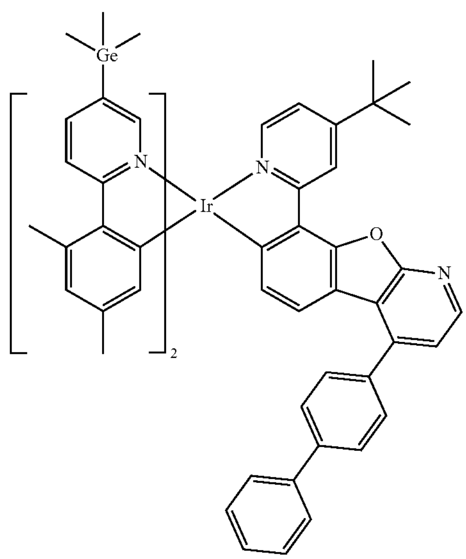
2265
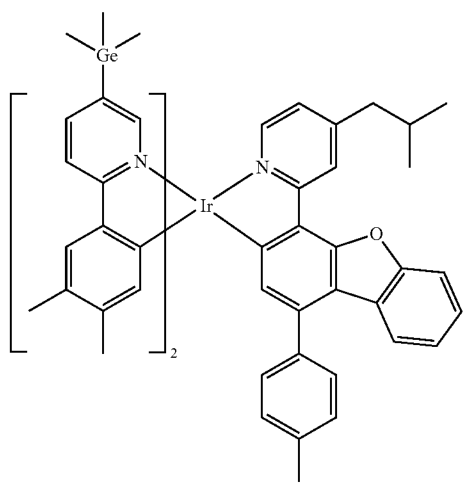
2266
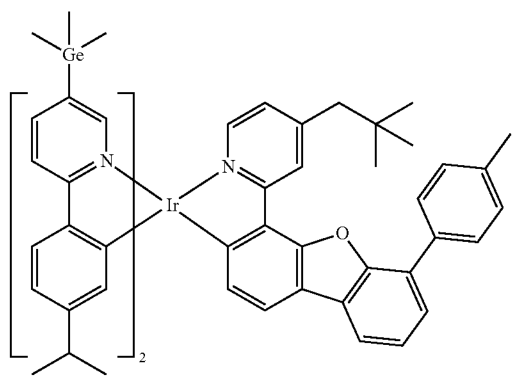
2267
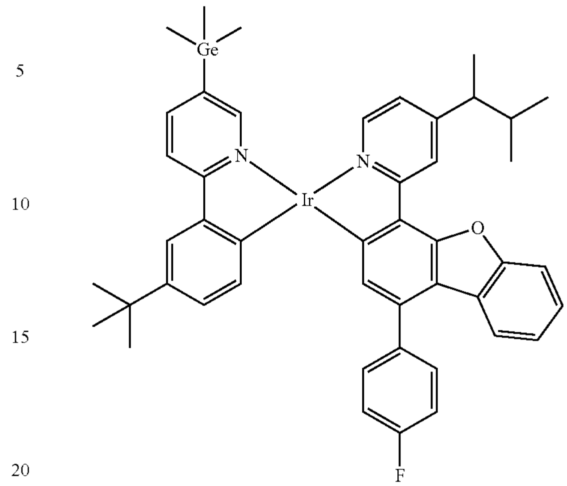
2268
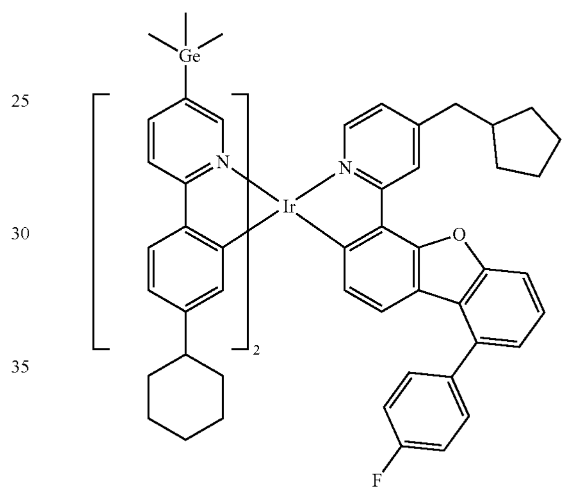
2269
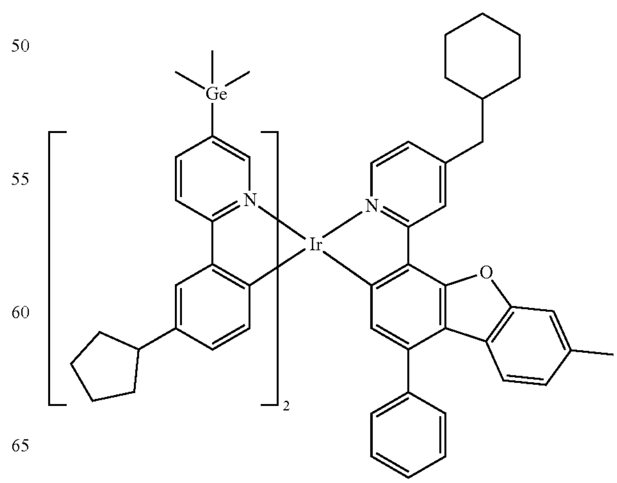

-continued
2270
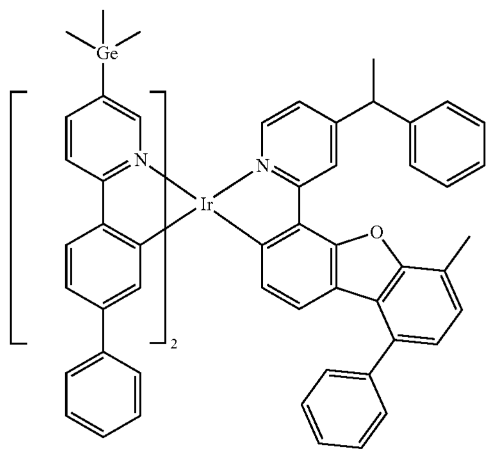
2271
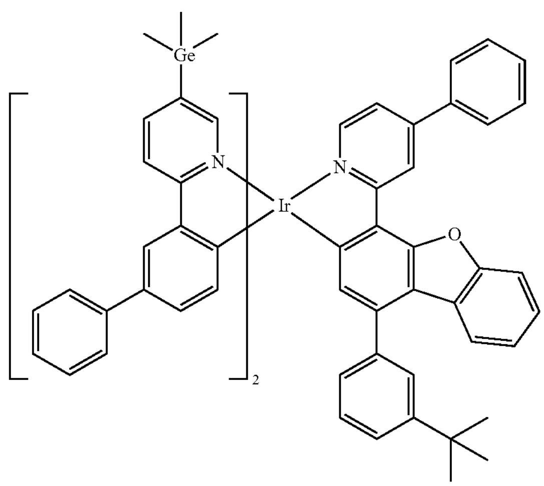
2272
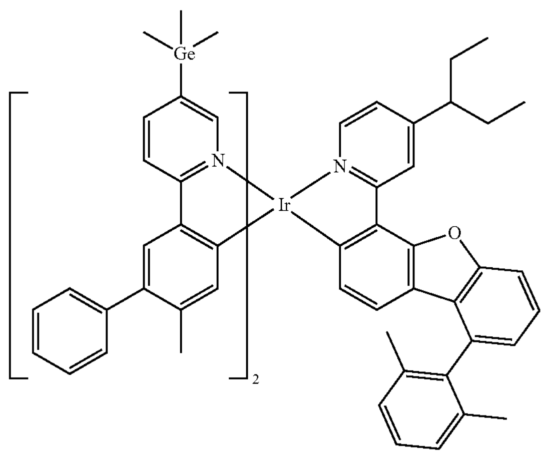
-continued
2273
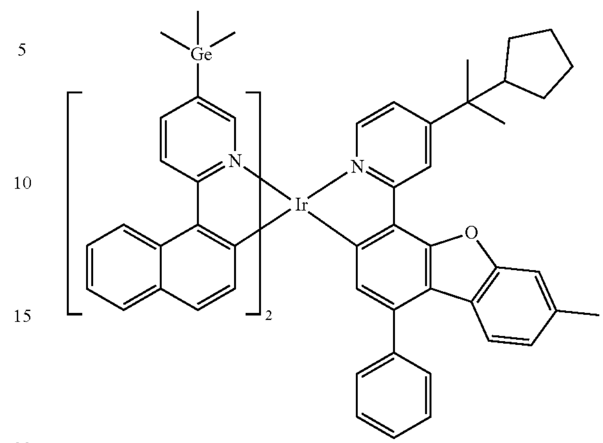
2274
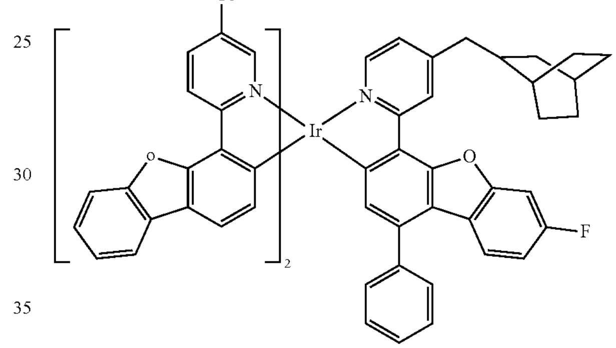
2275
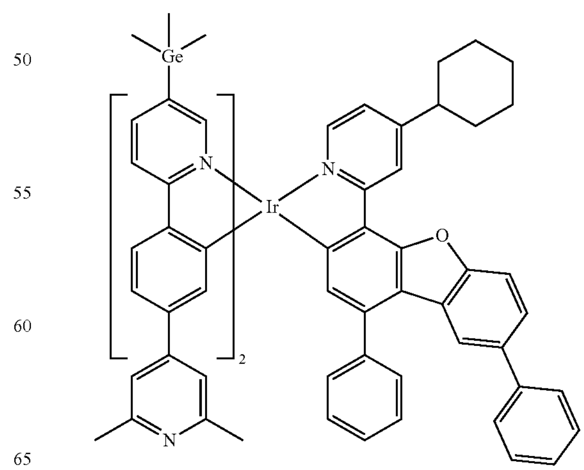

2276
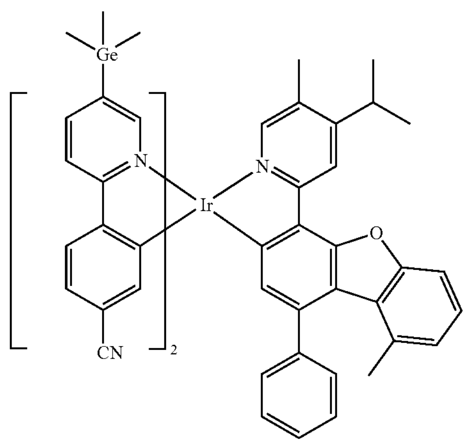
2277
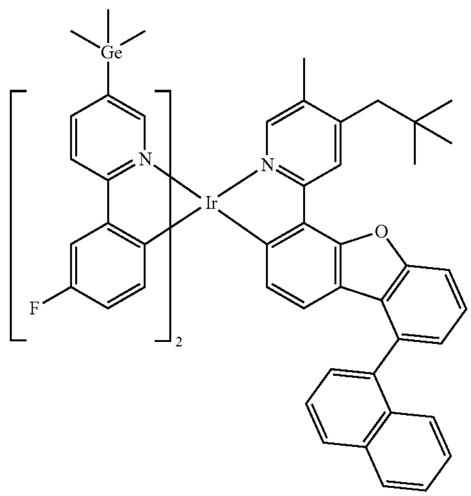
2278
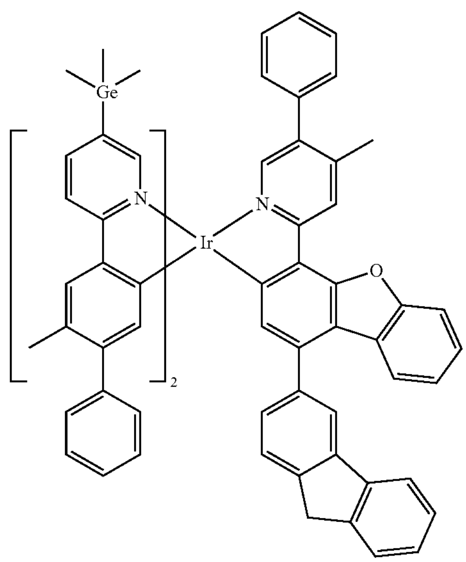
2279
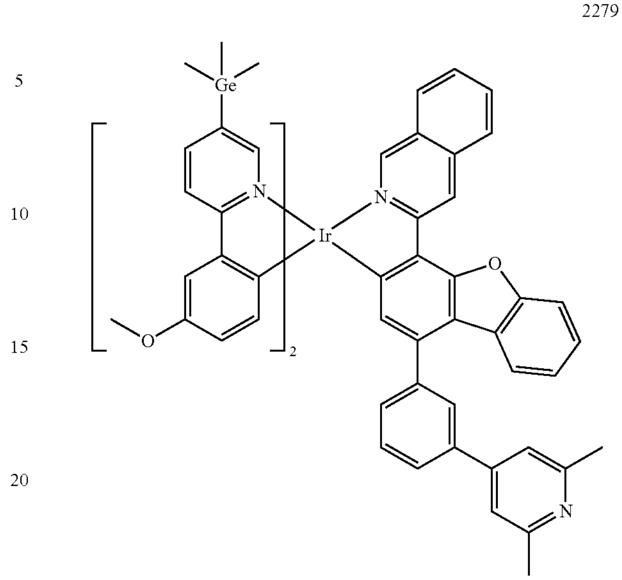
2280
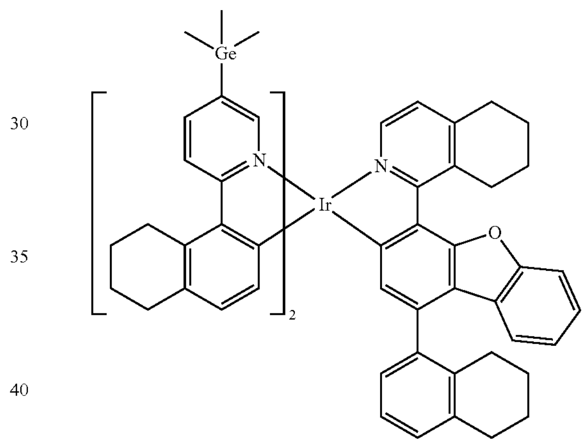
2281
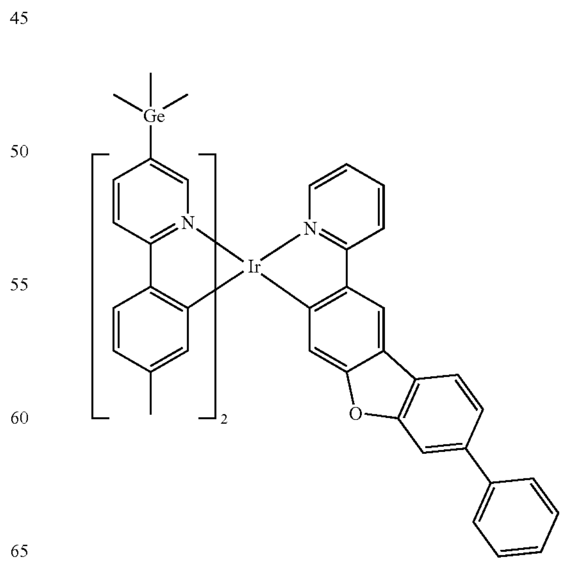

-continued
2282
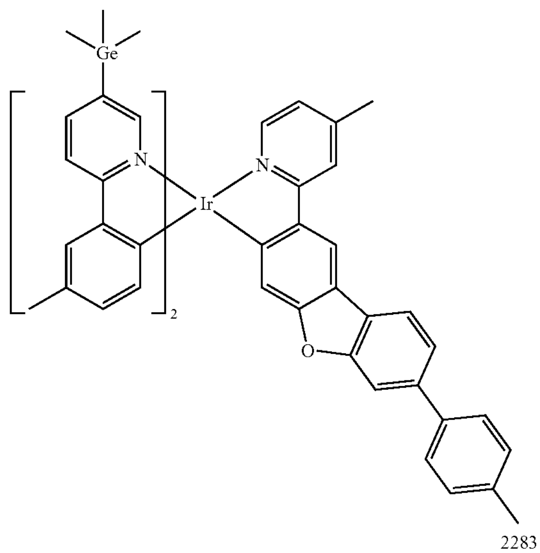
2283
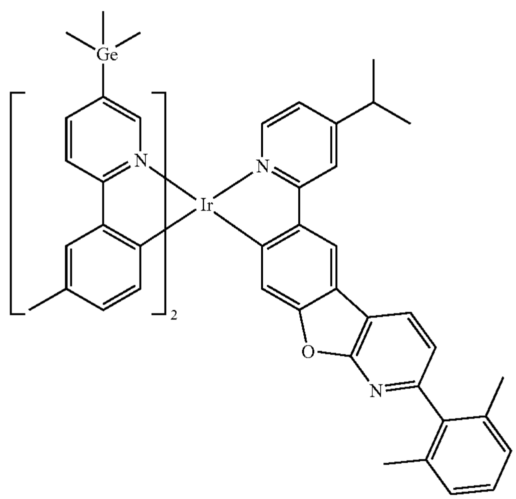
2284
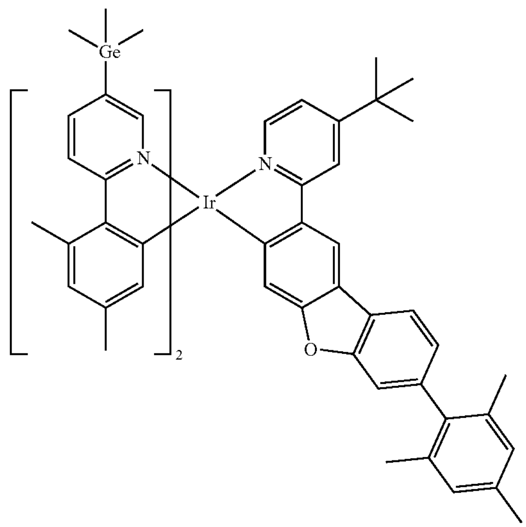
-continued
2285
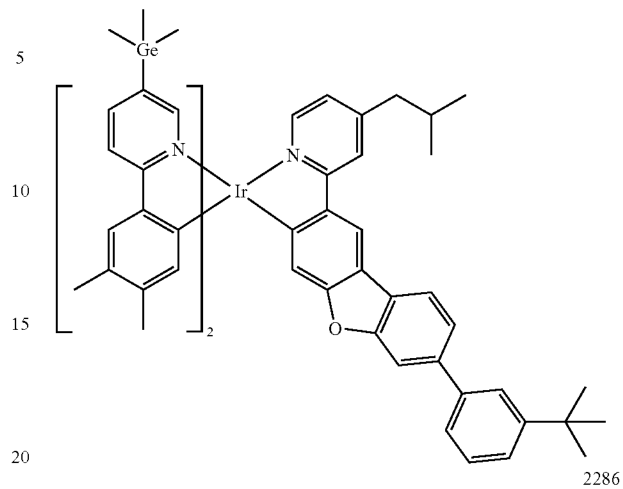
2286
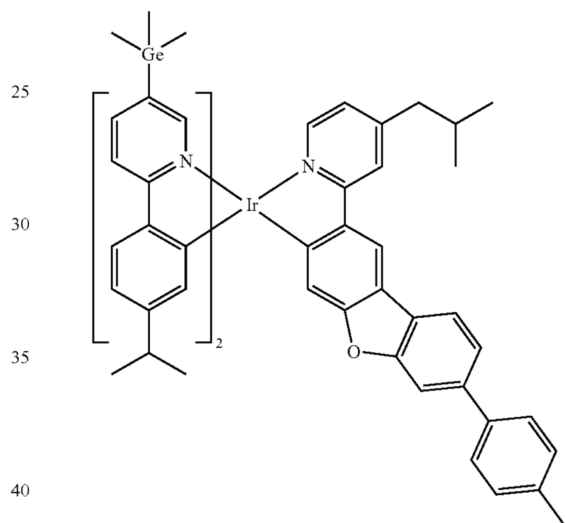
2287
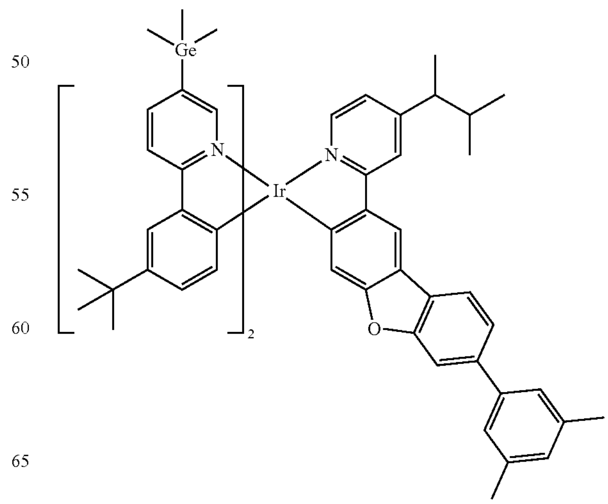

-continued
2288
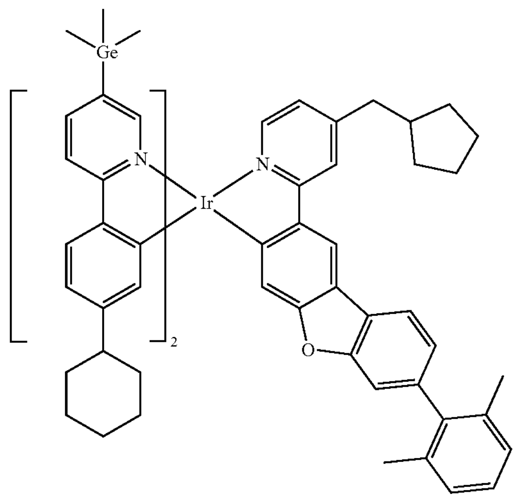
2289
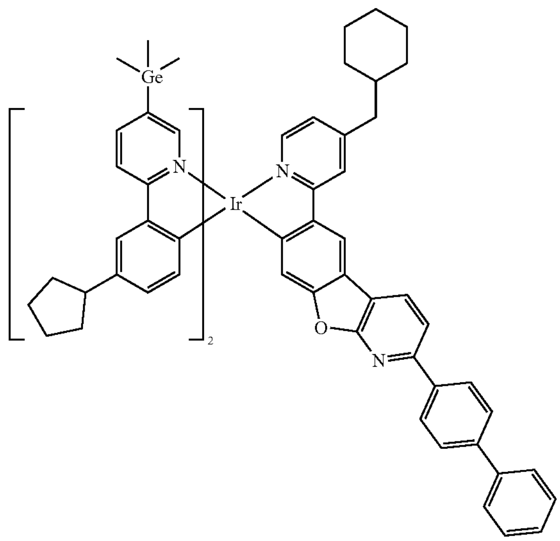
2290
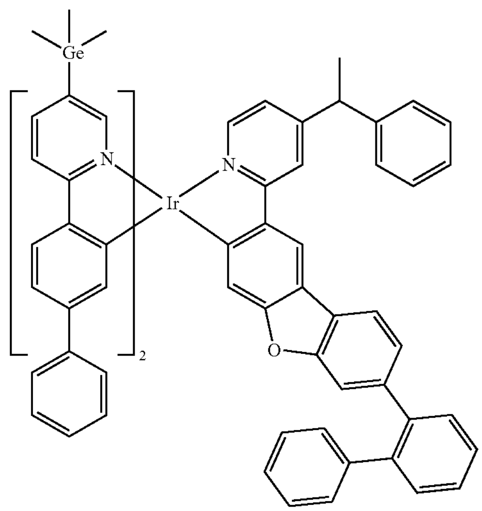
-continued
2291
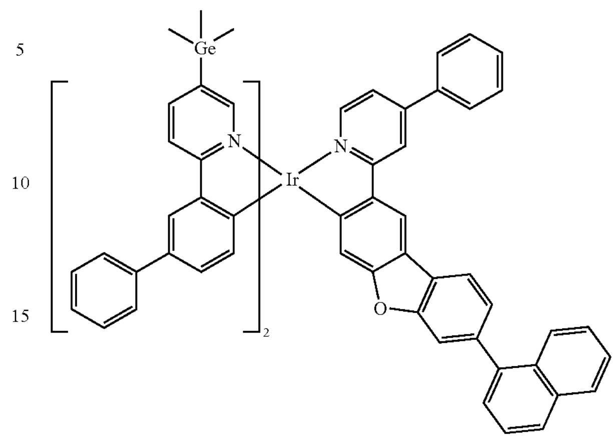
2292
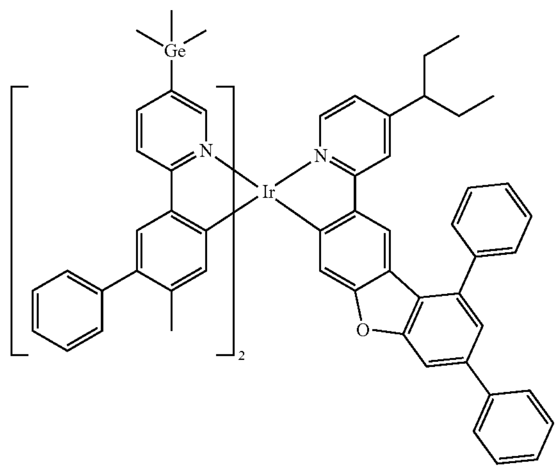
2293
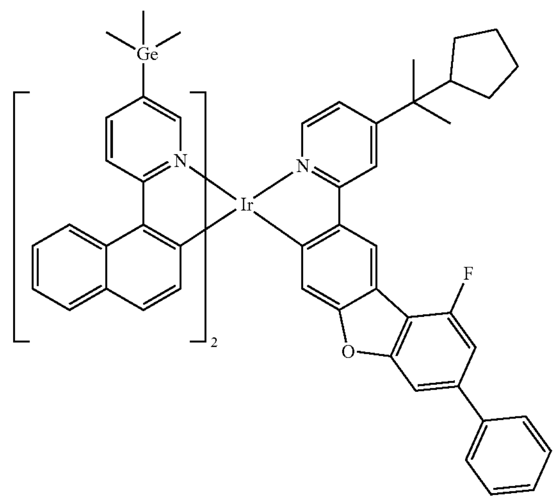

-continued
2294
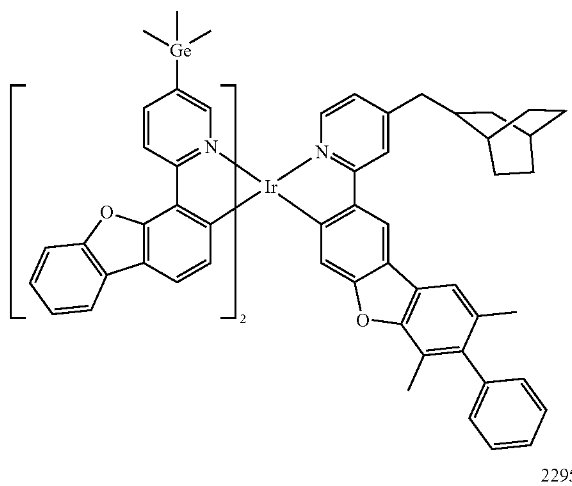
2295
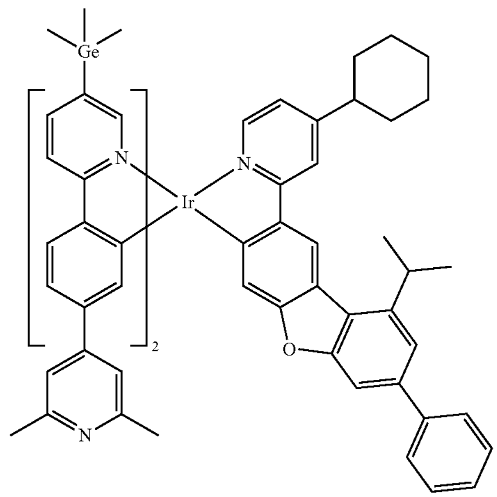
2296
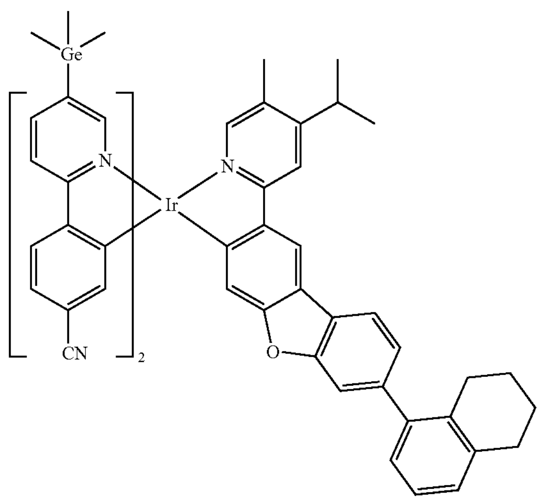
-continued
2297
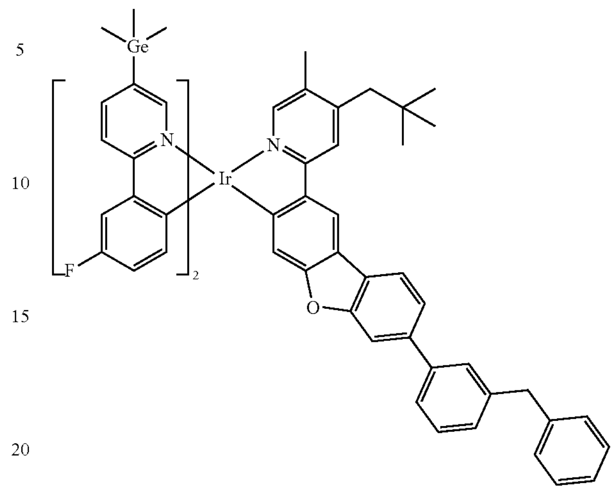
2298
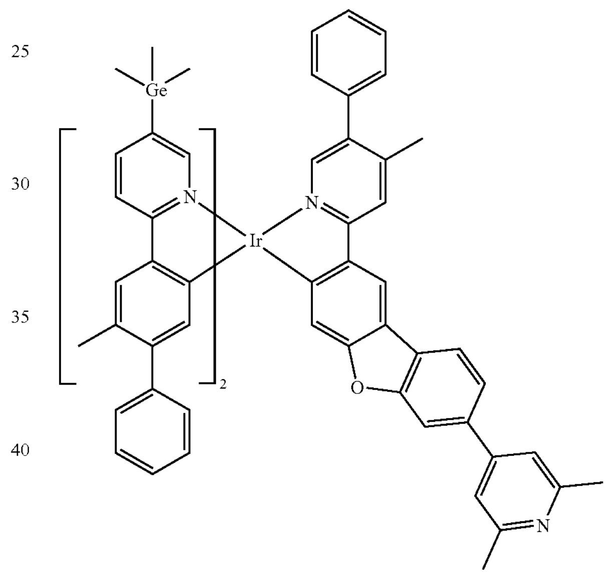
2299
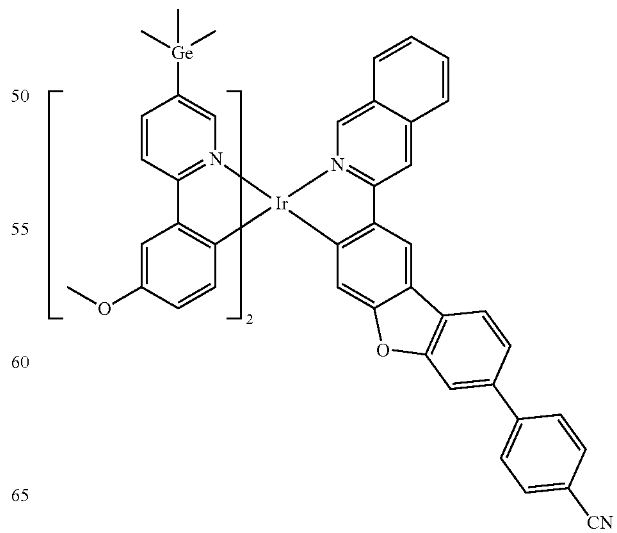

-continued
2300
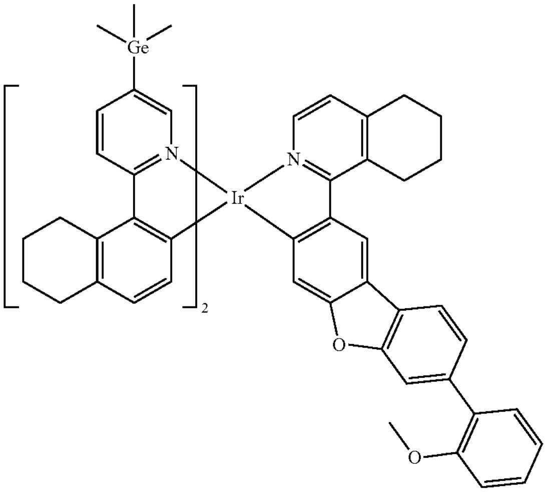
2301
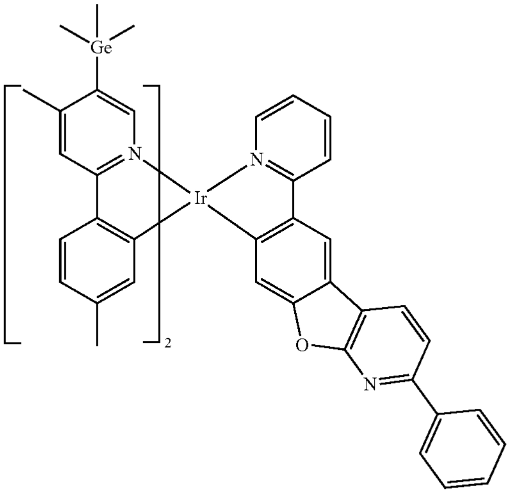
2302
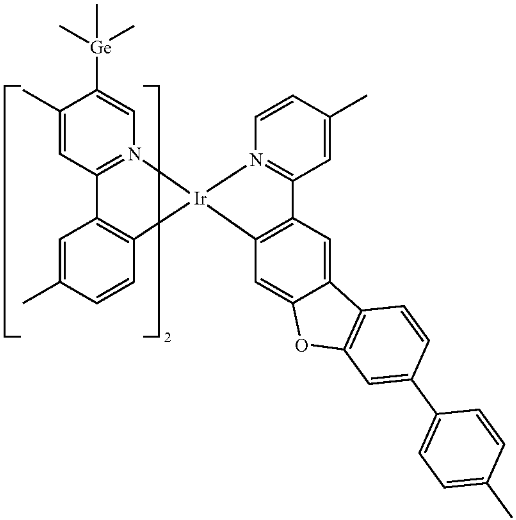
-continued
2303
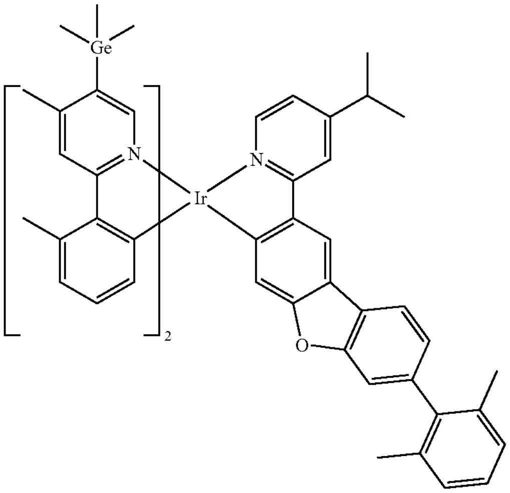
2304
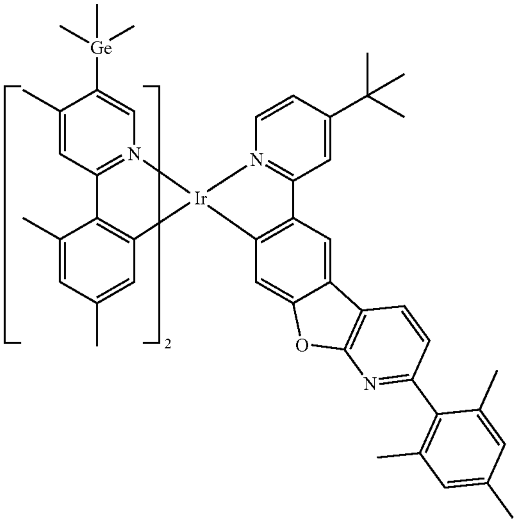
2305
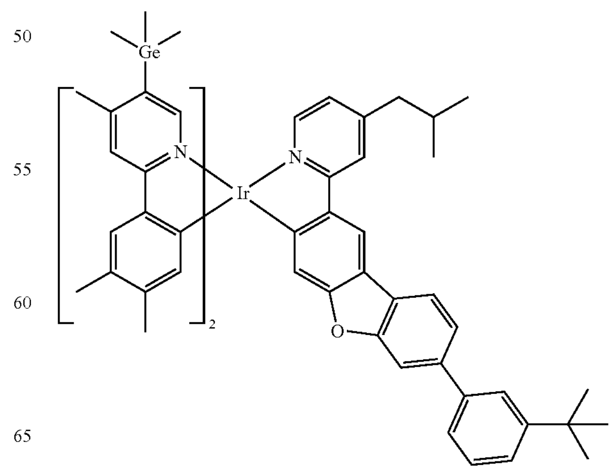

-continued
2306
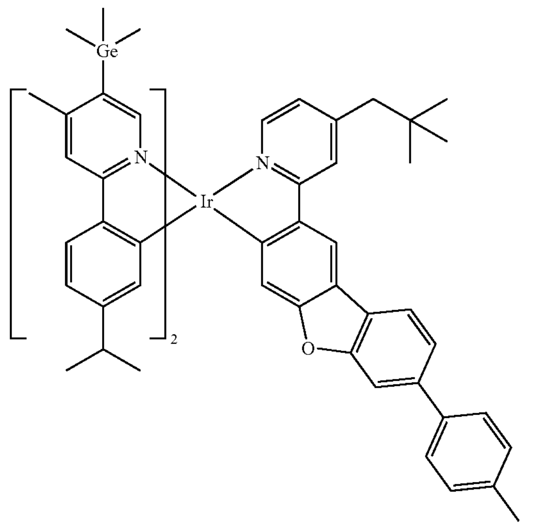
2307
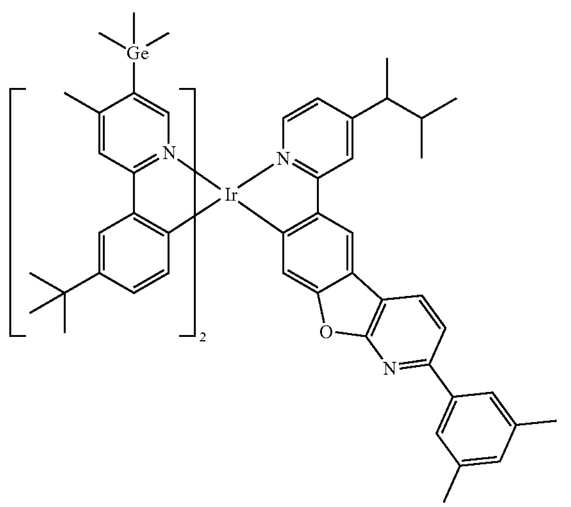
2308
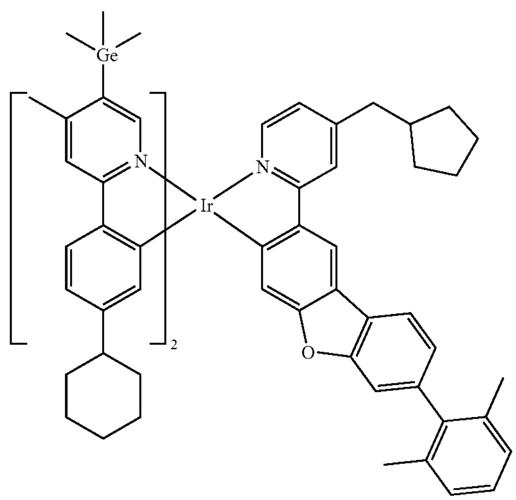
-continued
2309
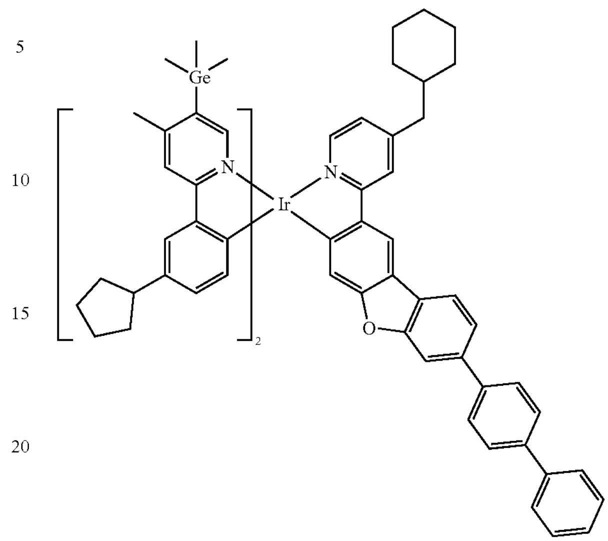
2310
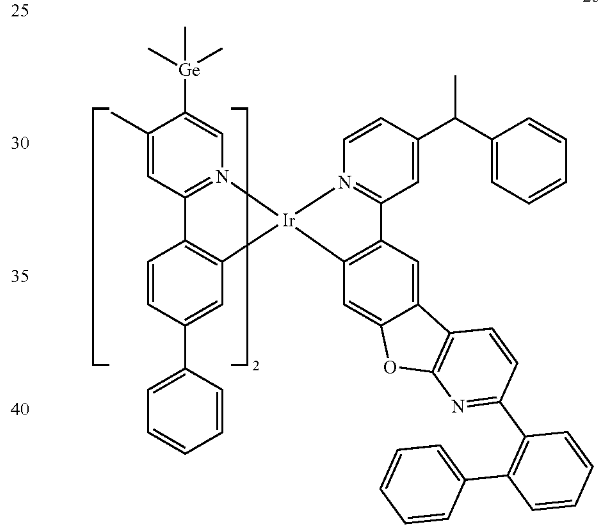
2311
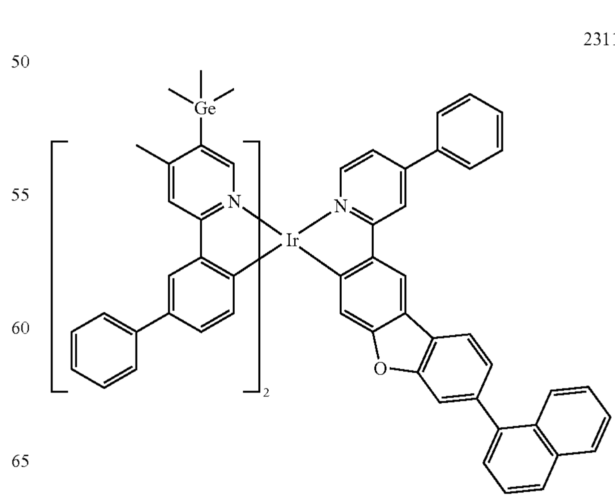

-continued
2312
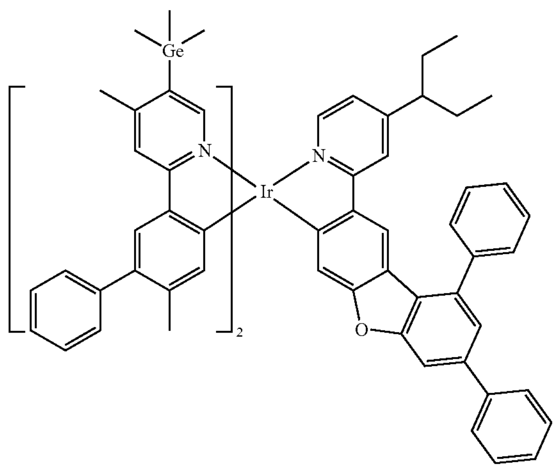
2313
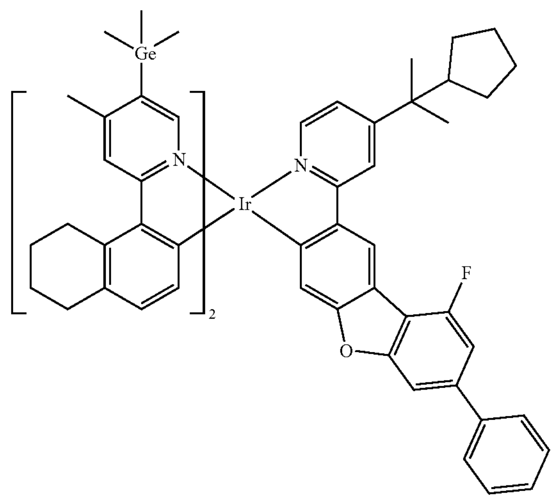
2314
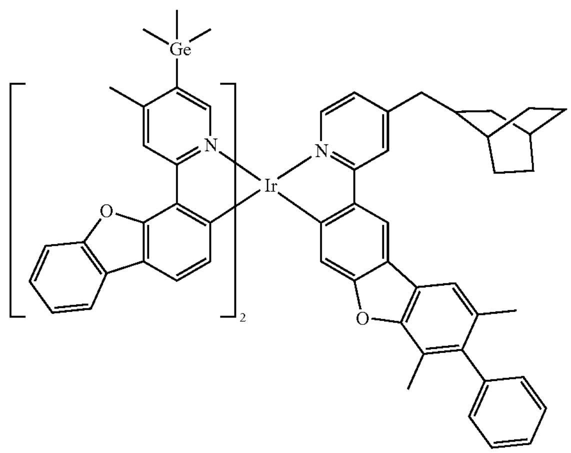
-continued
2315
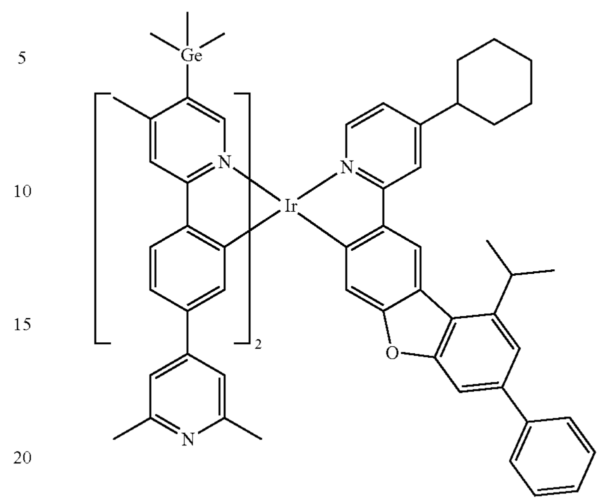
2316
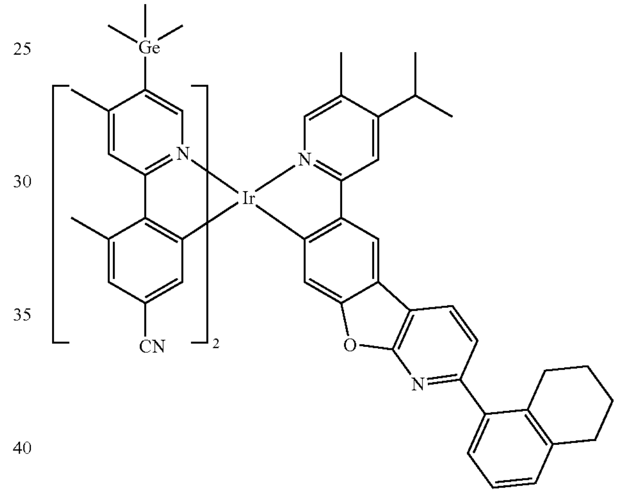
2317
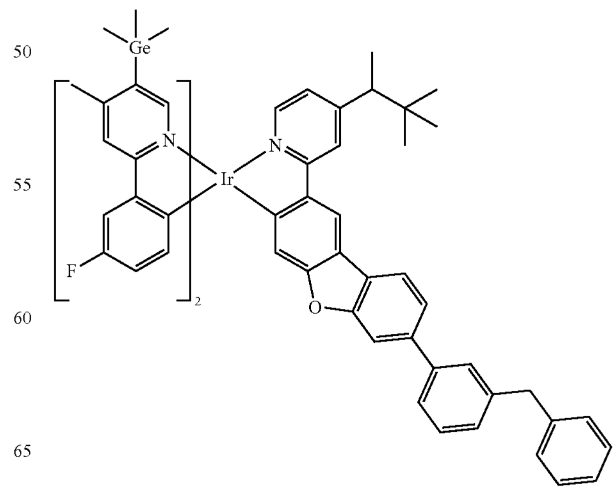

-continued
2318
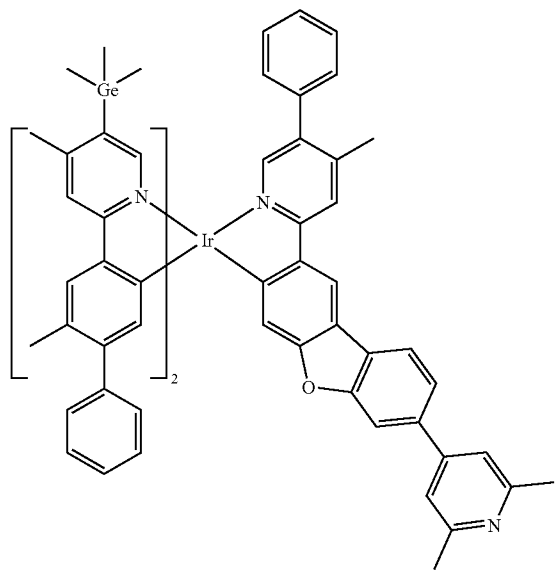
2319
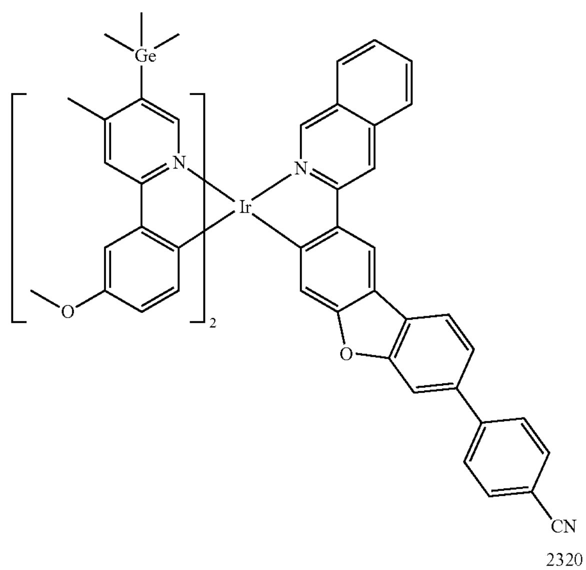
2320
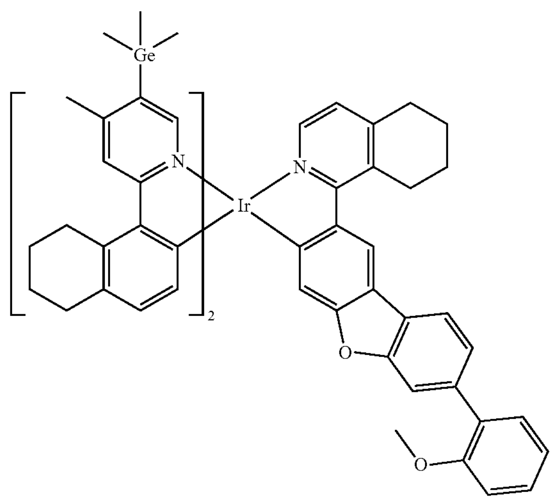
-continued
2321
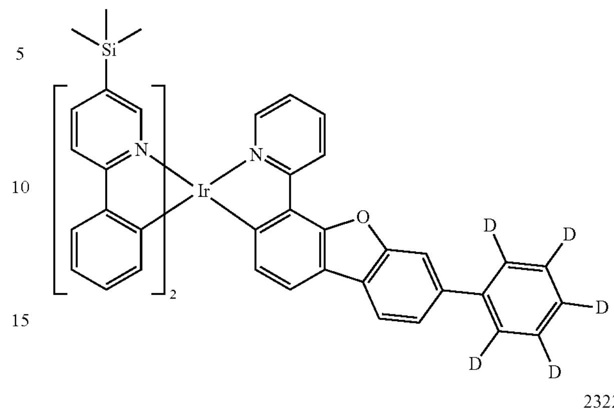
2322
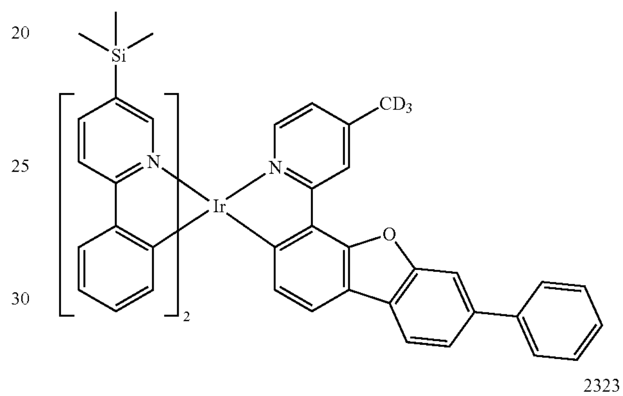
2323
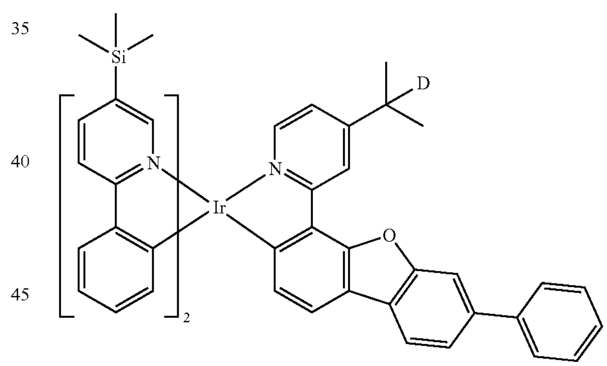
2324
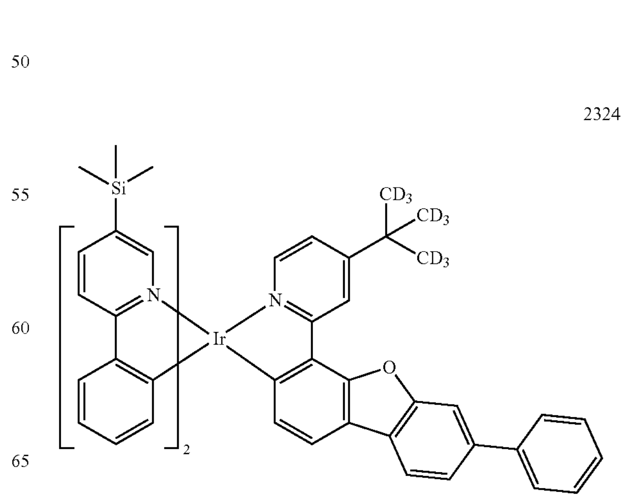

-continued
2325
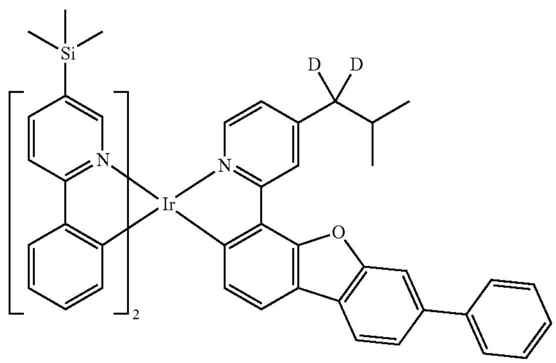
2326
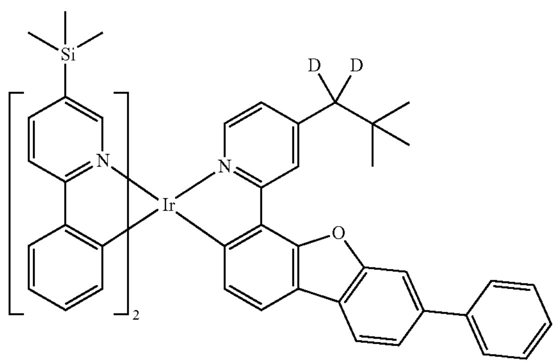
2327
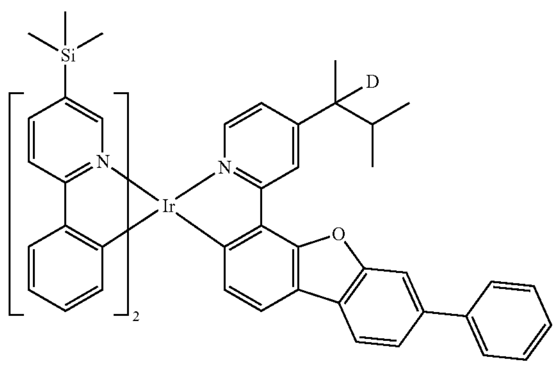
2328
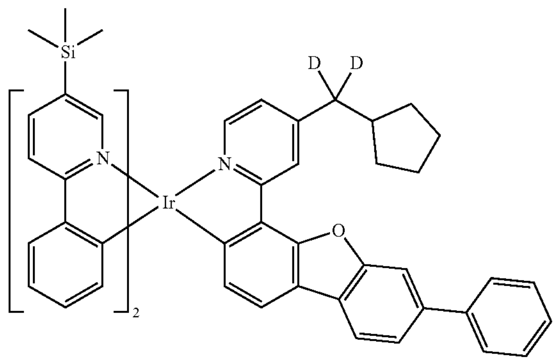
-continued
2329
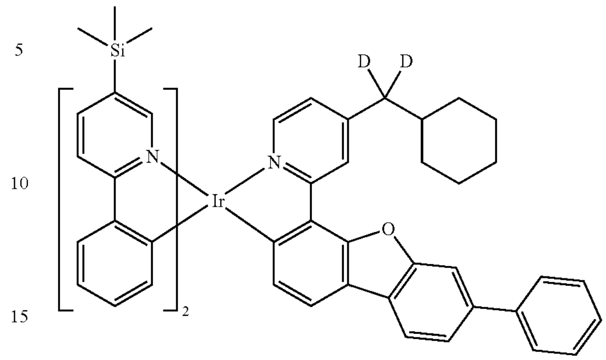
2330
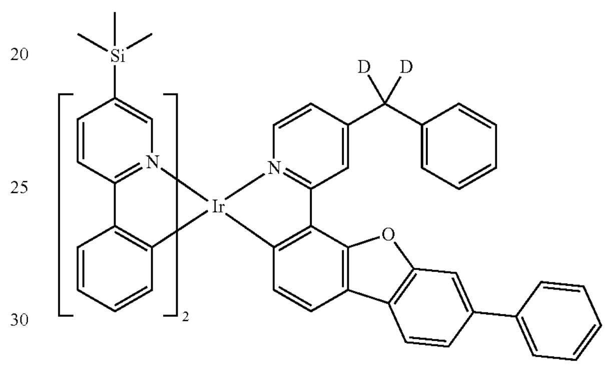
2331
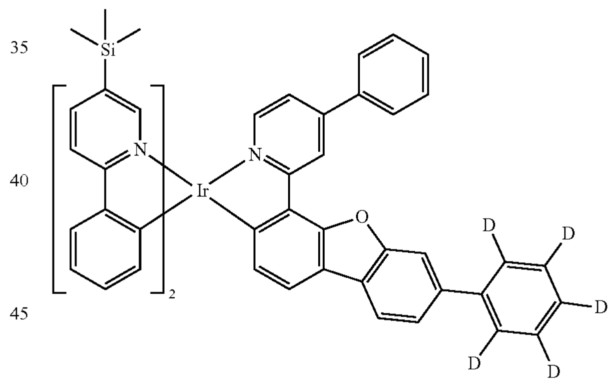
2332
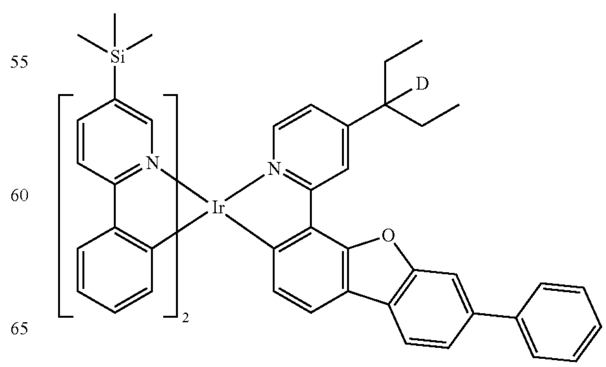

-continued
2333
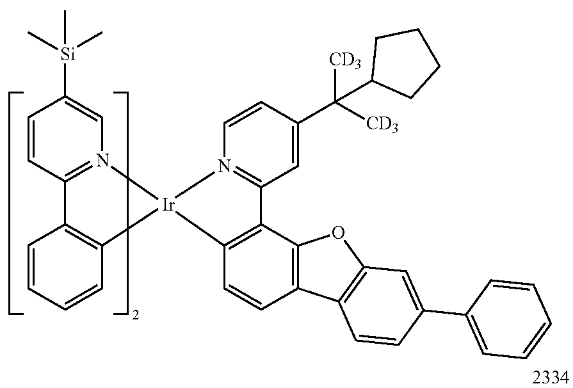
2334
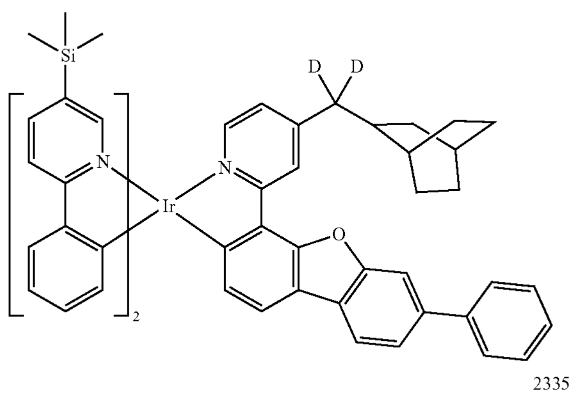
2335
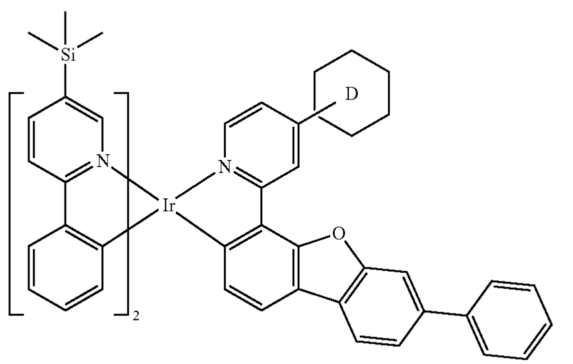
2336
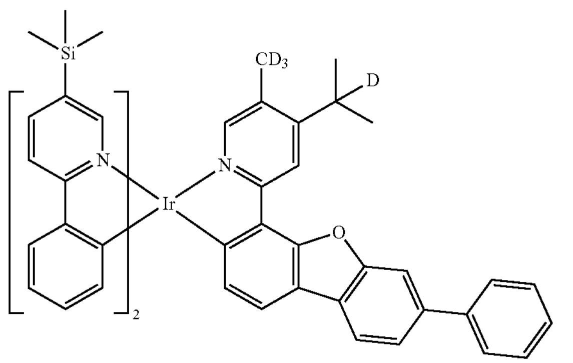
-continued
2337
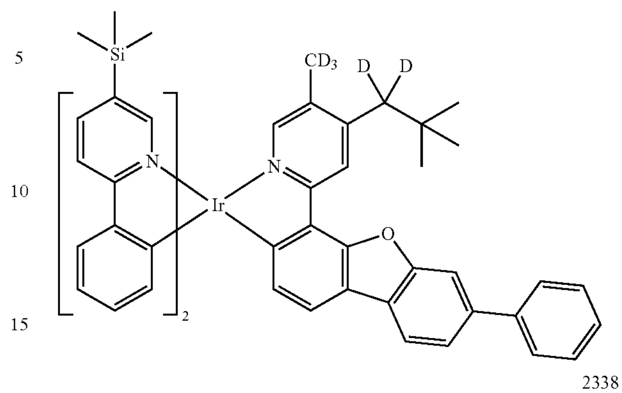
2338
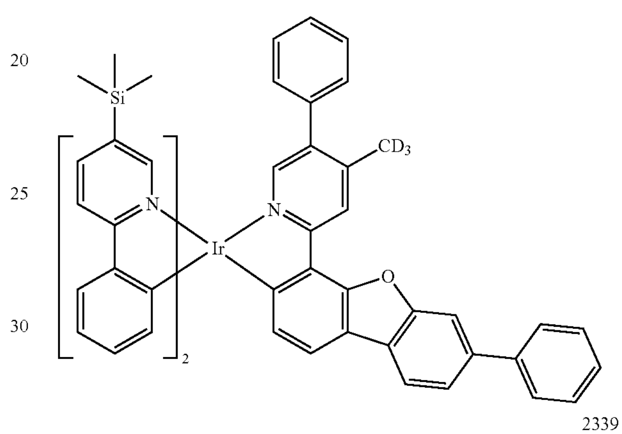
2339
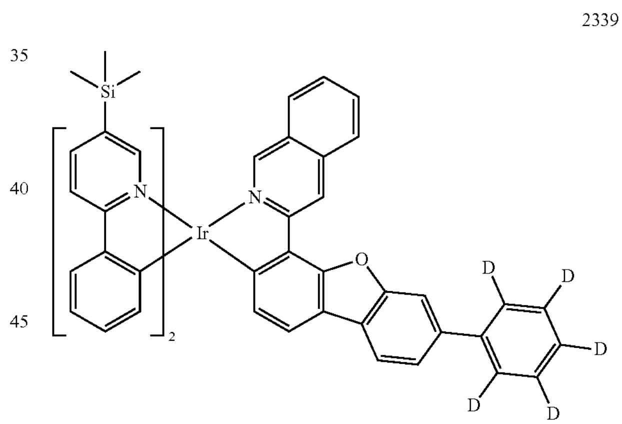
2340
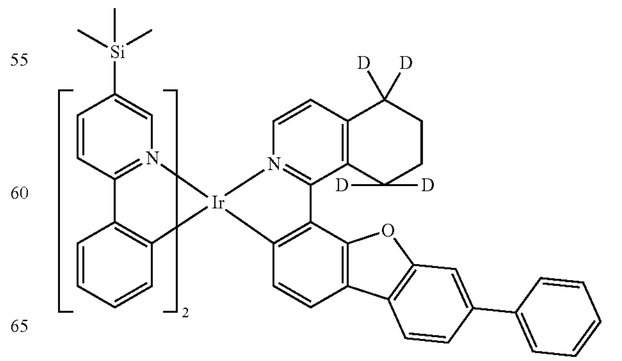

-continued
2341
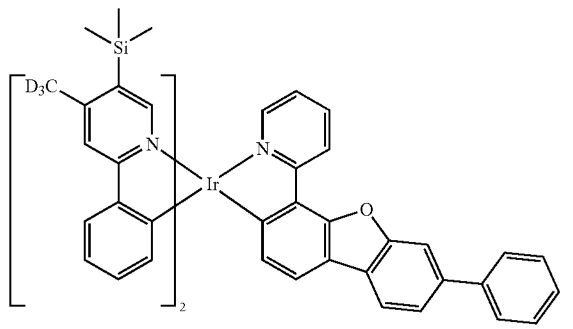
2342
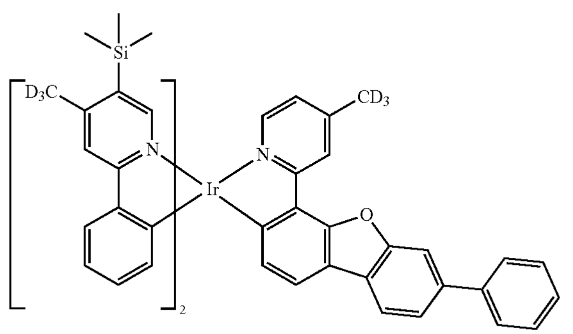
2343
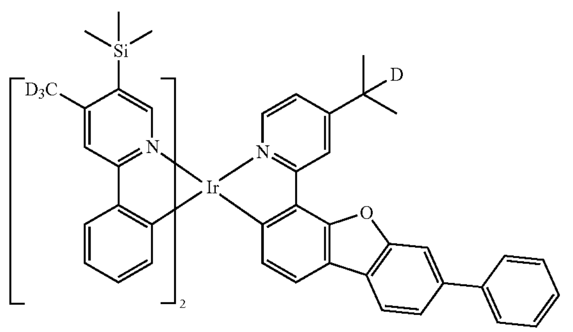
2344
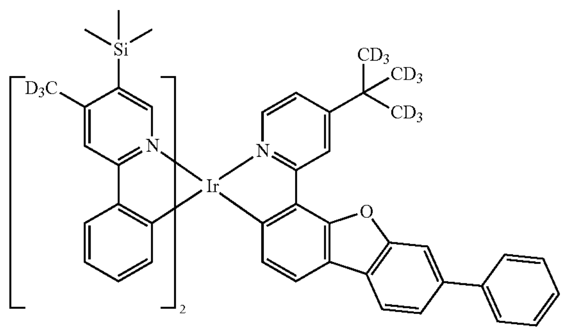
-continued
2345
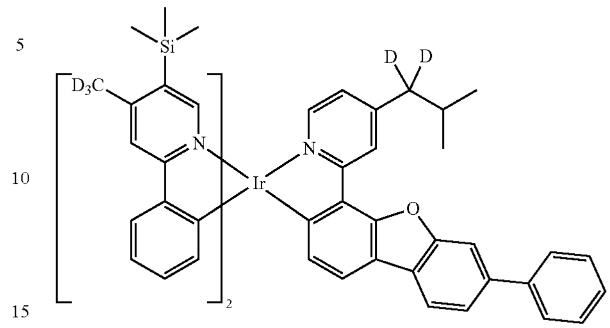
2346
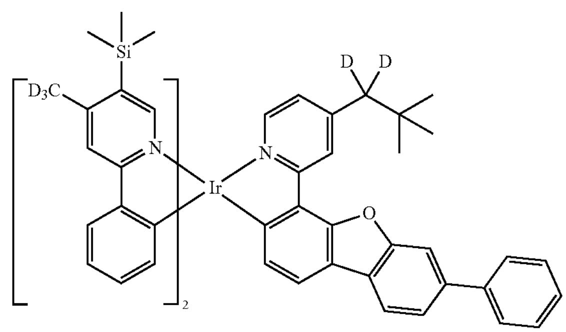
2347
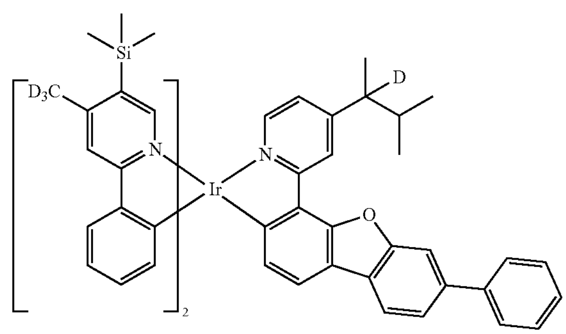
2348
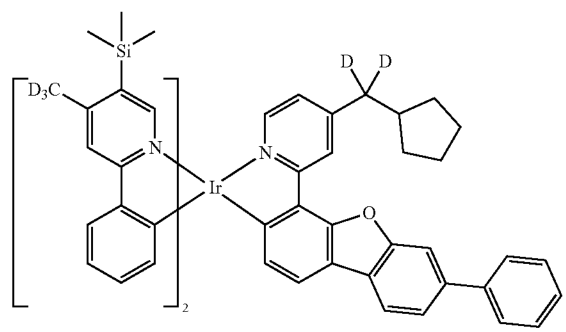

-continued
2349
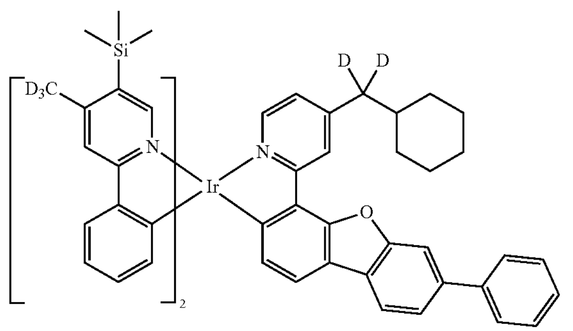
2350
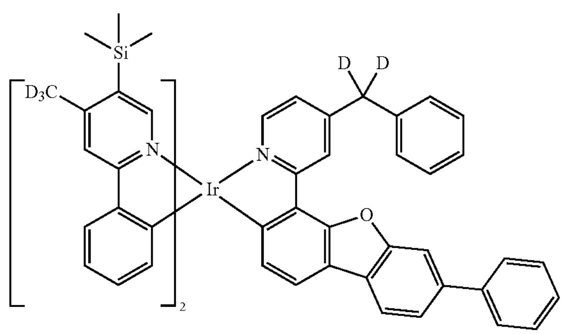
2351
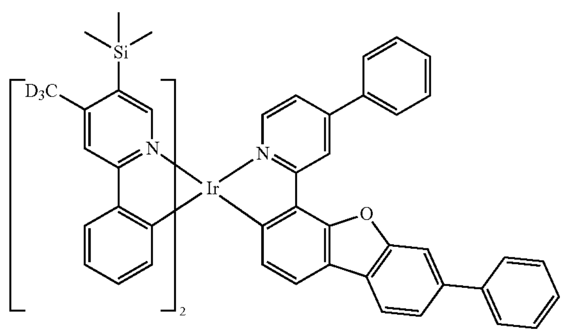
2352
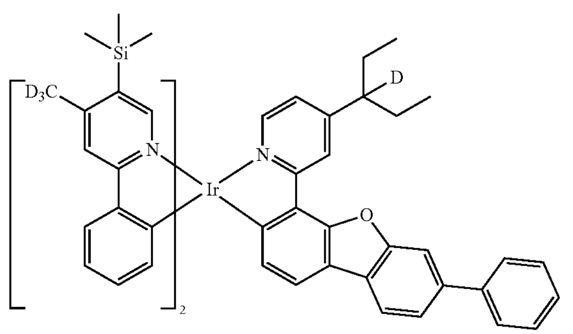
-continued
2353
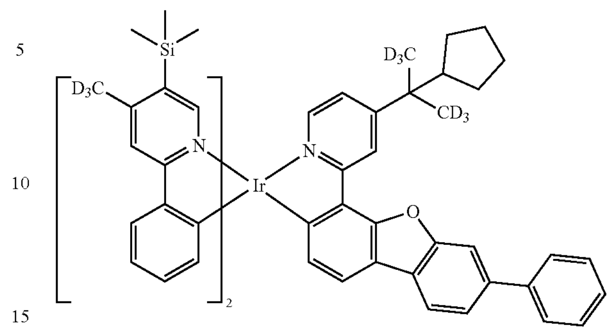
2354
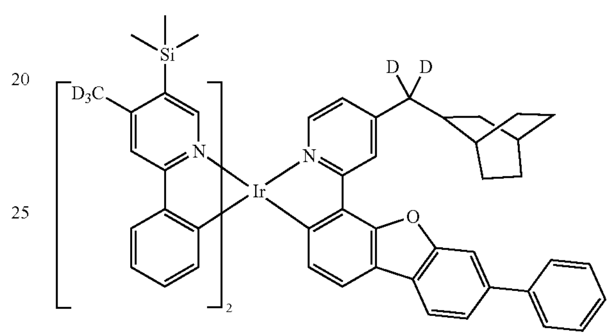
2355
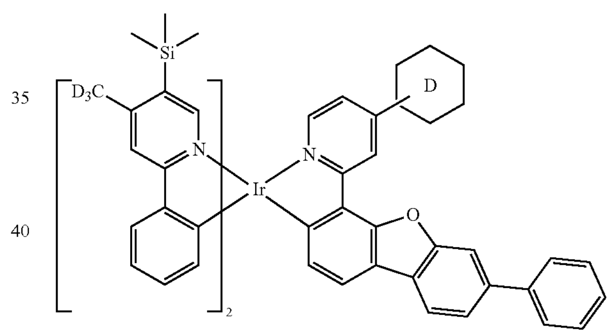
2356
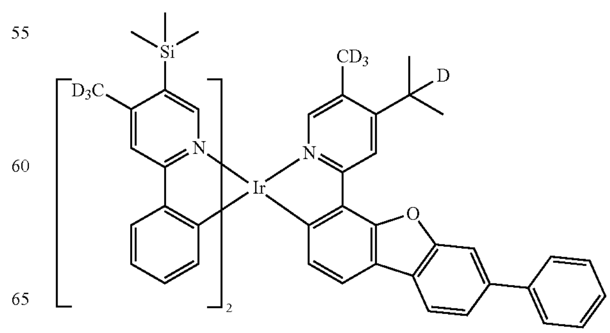

-continued
2357
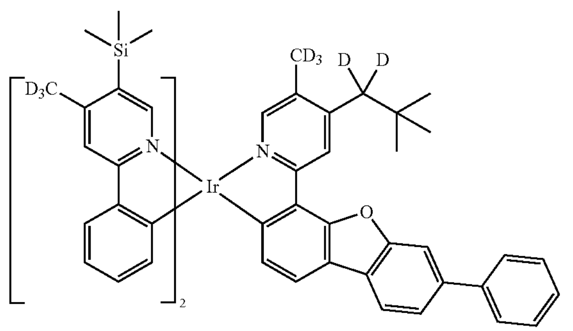
2358
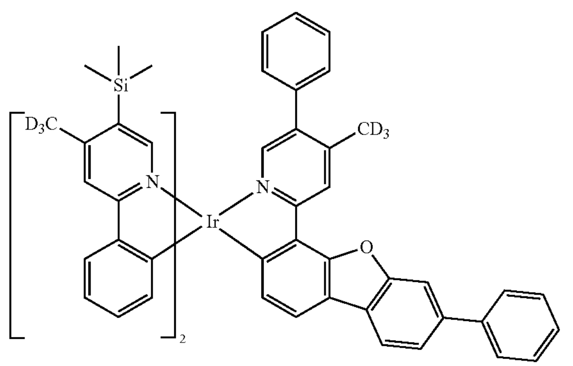
2359
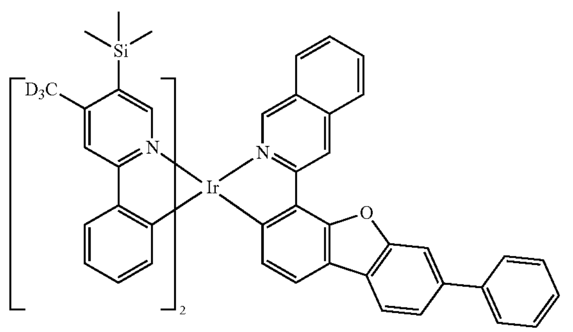
2360
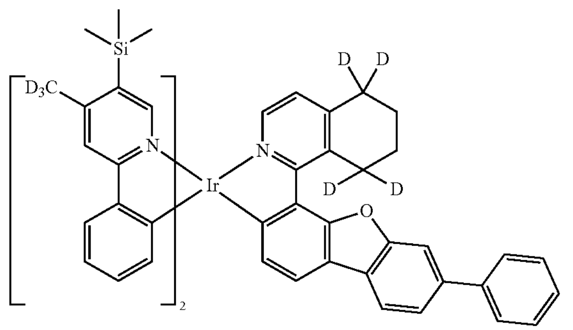
-continued
2361
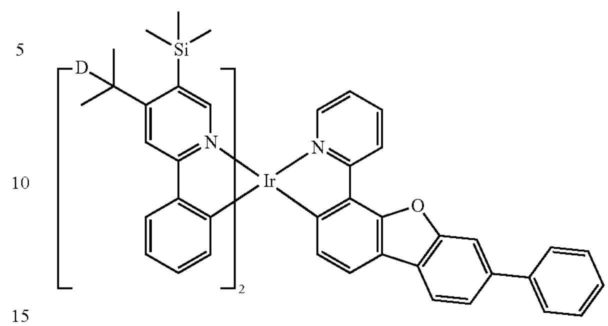
2362
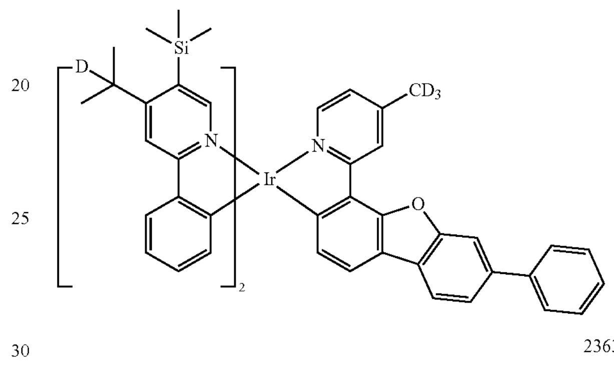
2363
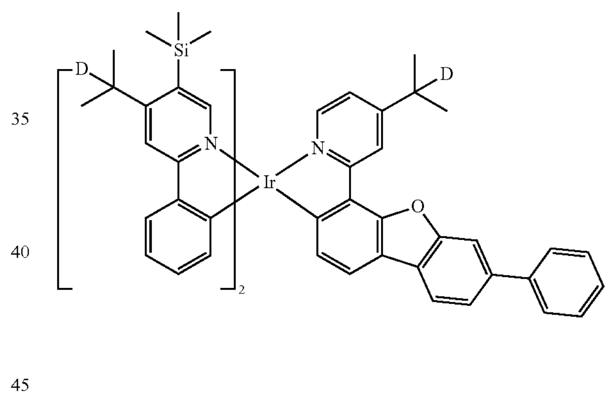
2364
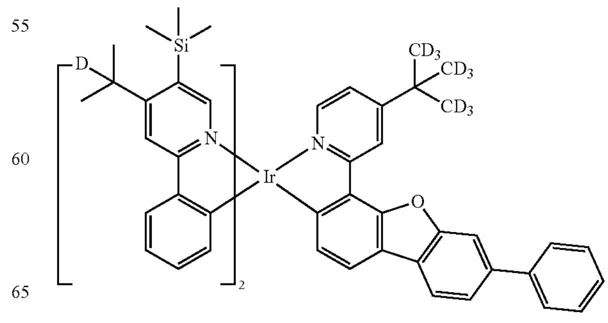

-continued
2365
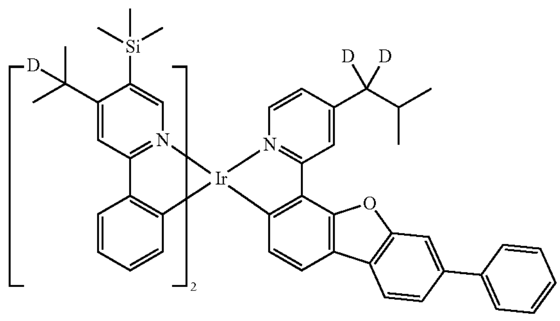
2366
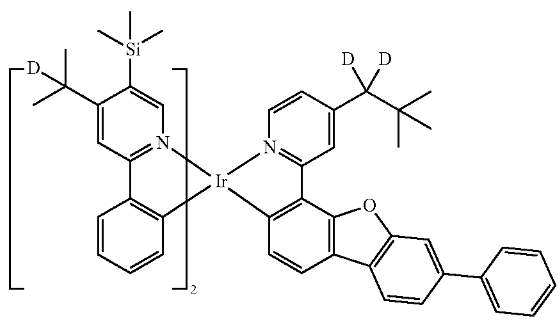
2367
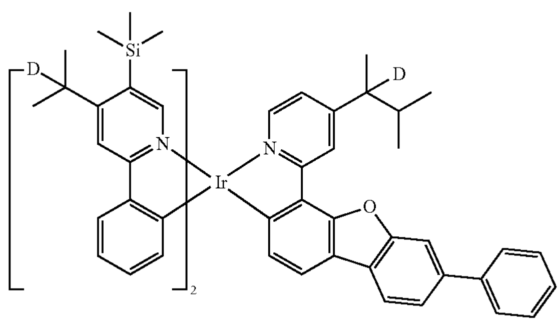
2368
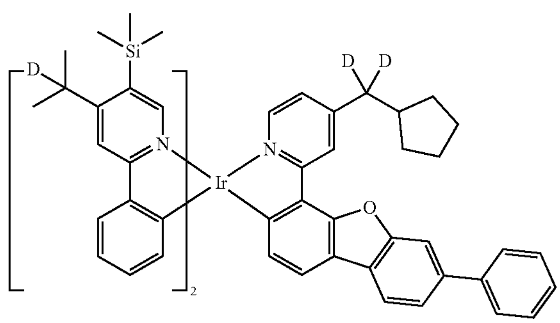
-continued
2369
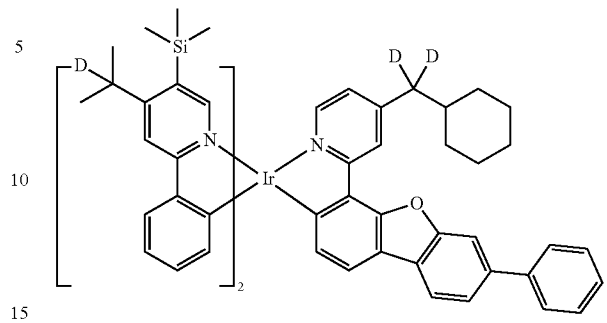
2370
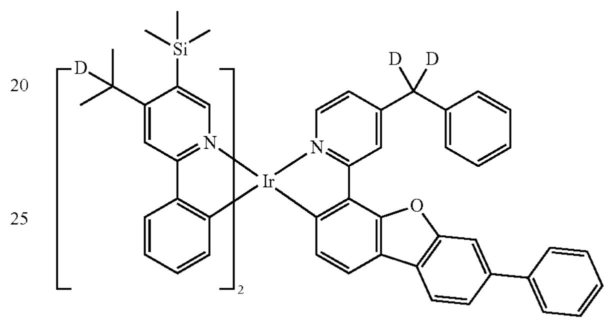
2371
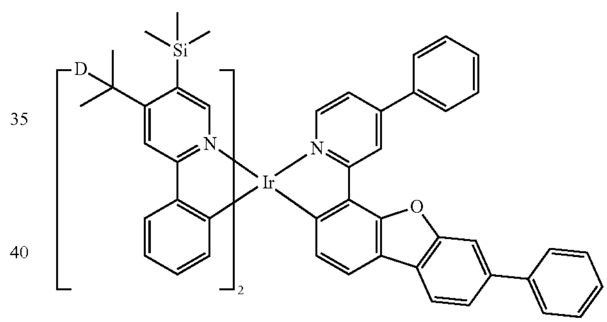
2372
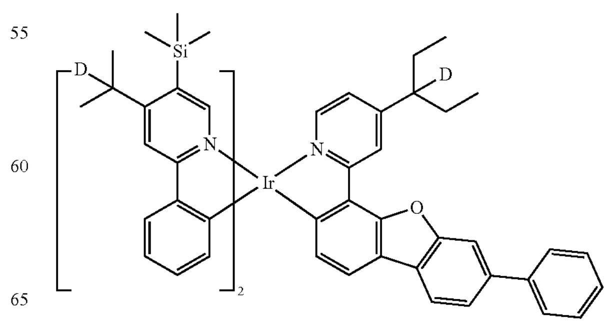

-continued
2373
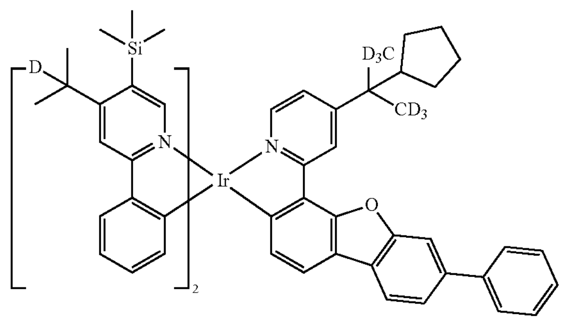
2374
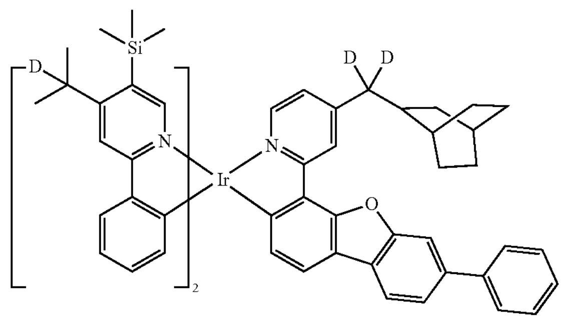
2375
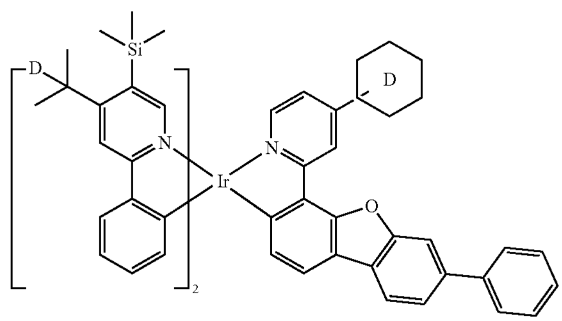
2376
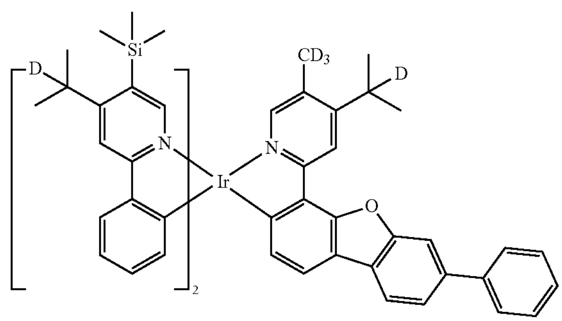
-continued
2377
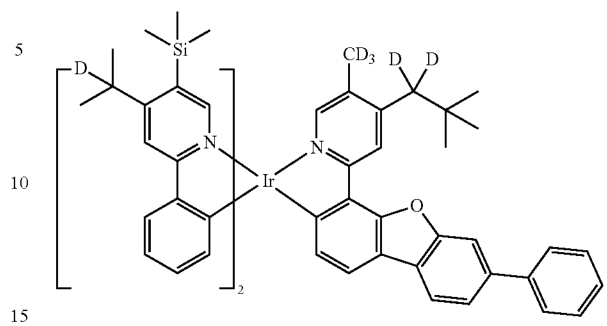
2378
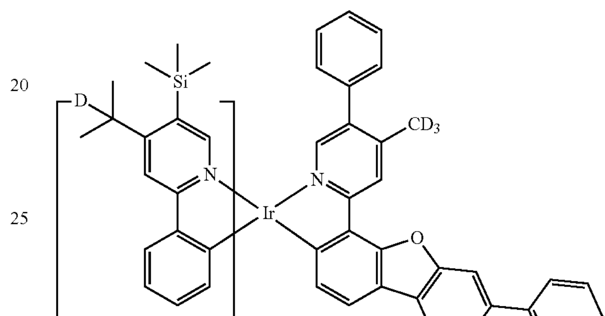
2379
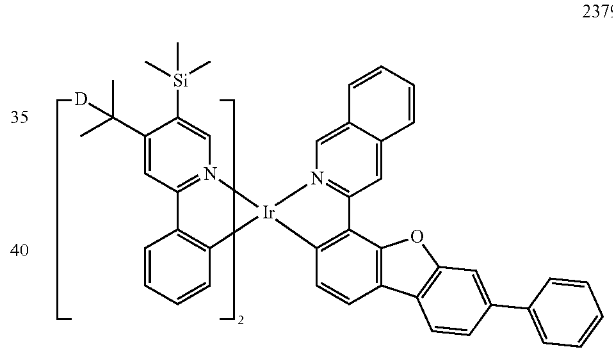
2380
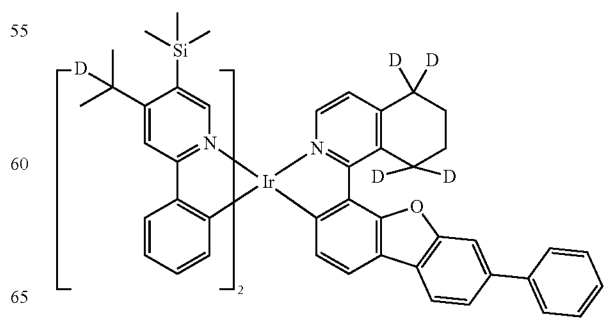

-continued
2381
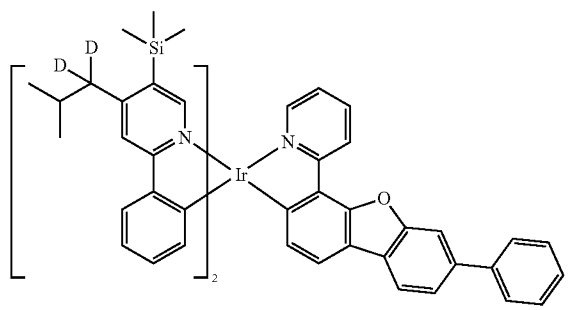
2382
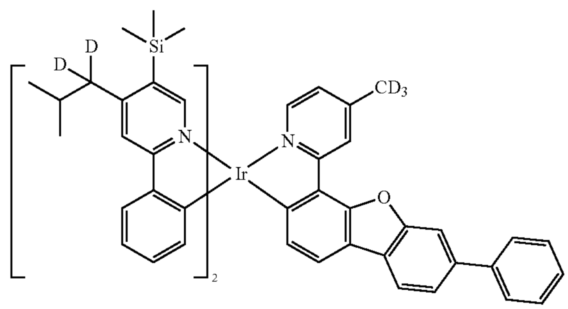
2383
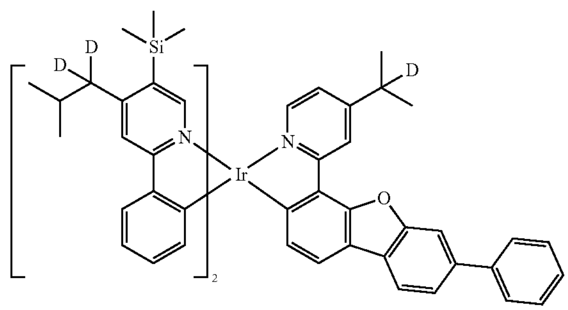
2384
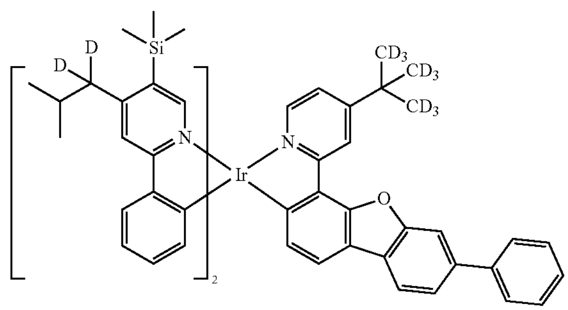
2385
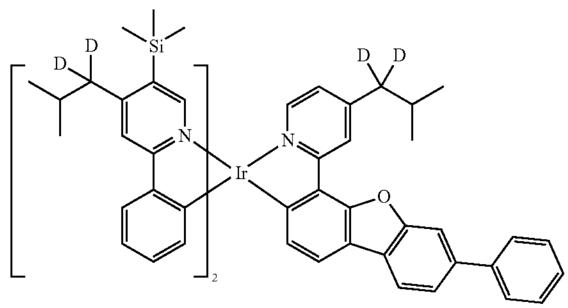
-continued
2386
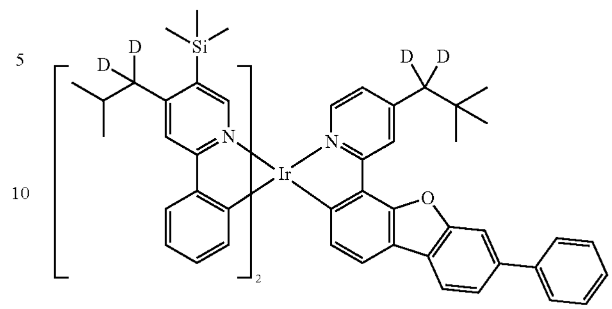
2387
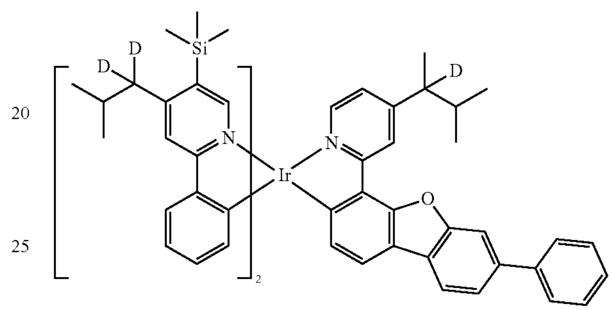
2388
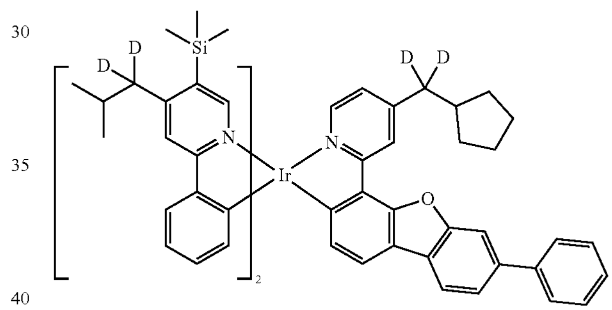
2389
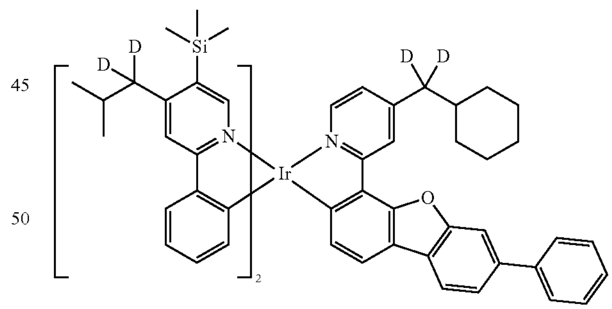
2390
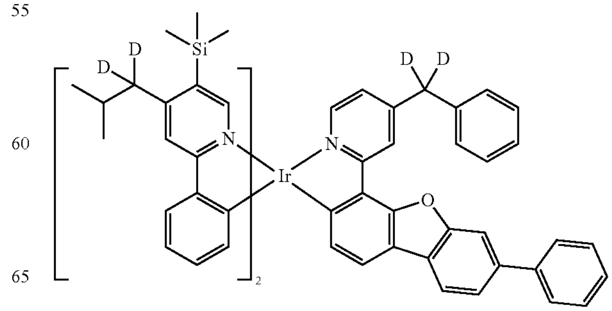
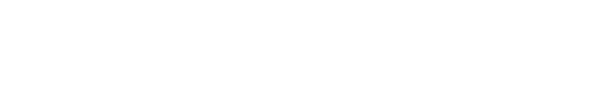

-continued
2391
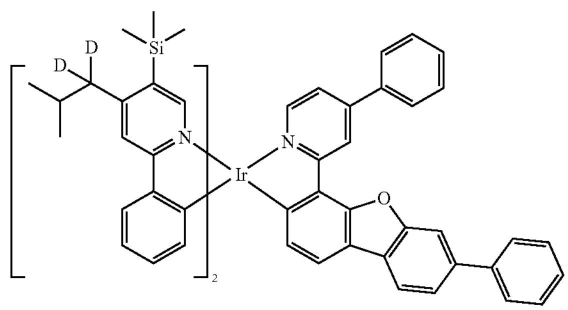
2392
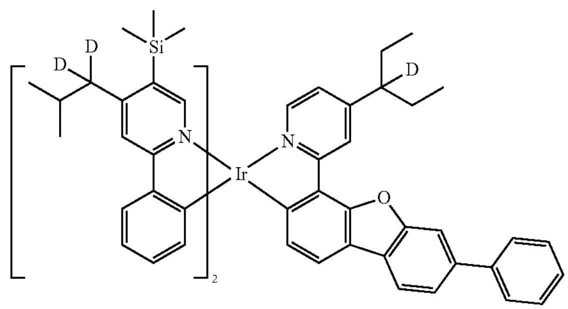
2393
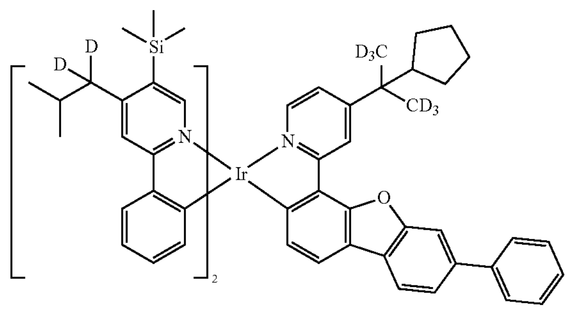
2394
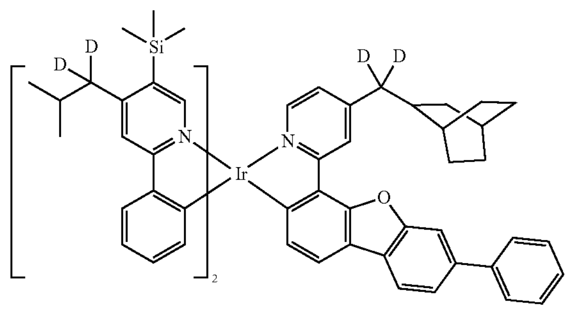
2395
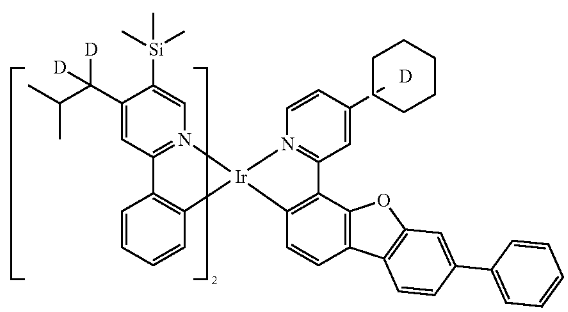
-continued
2396
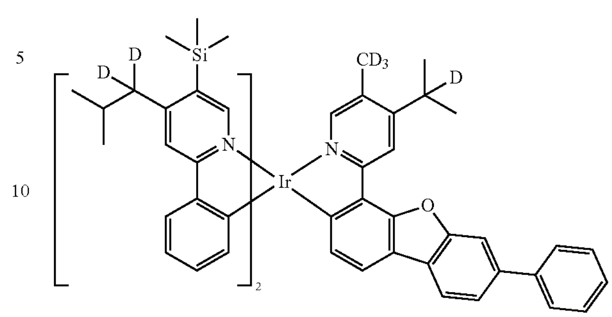
2397
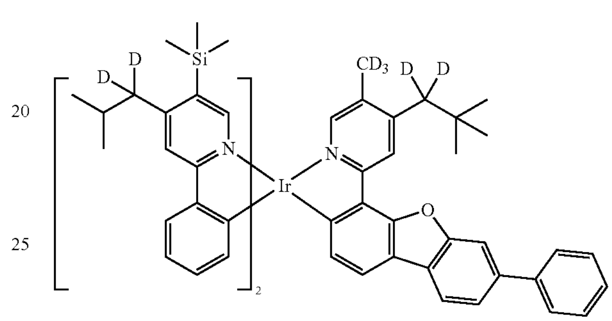
2398
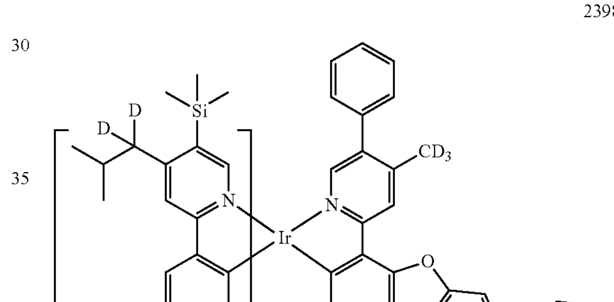
2399
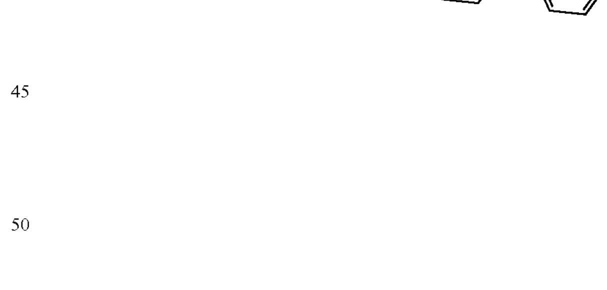
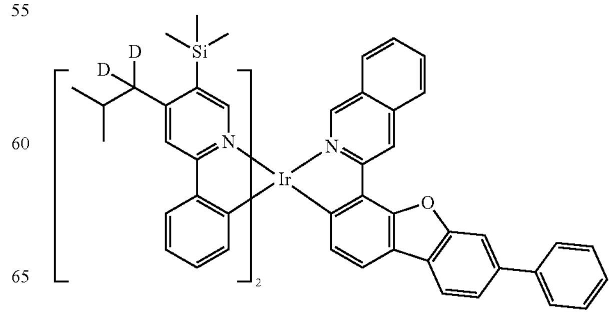

-continued
2400
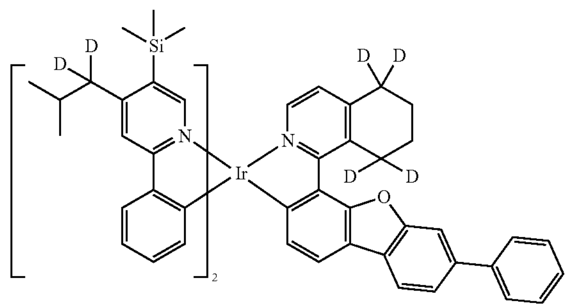
2401
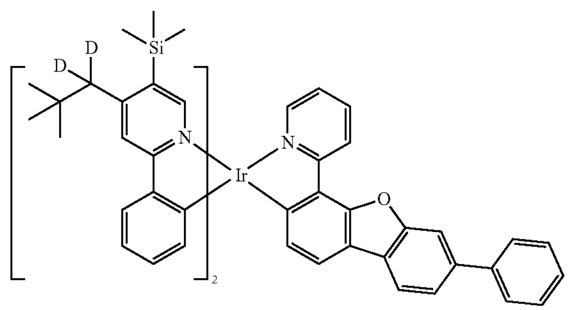
2402
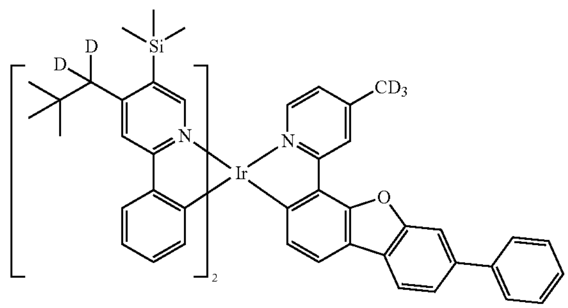
2403
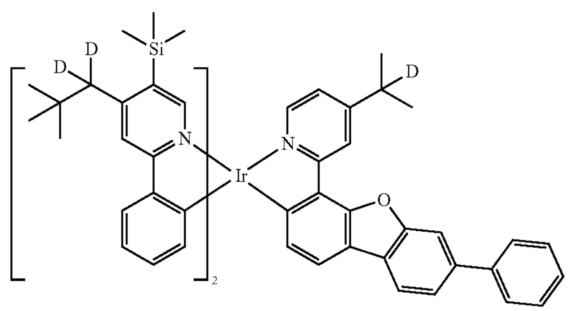
2404
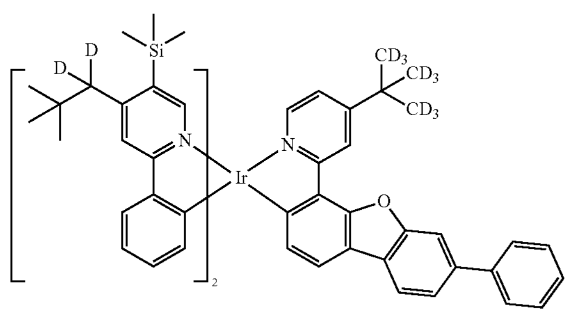
-continued
2405
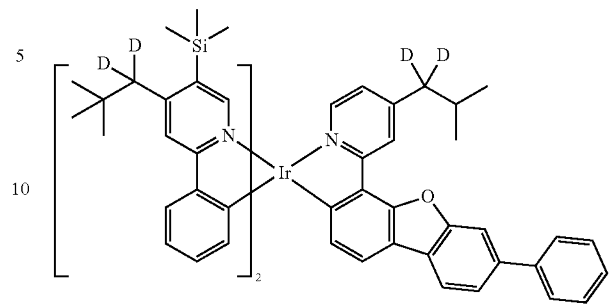
2406
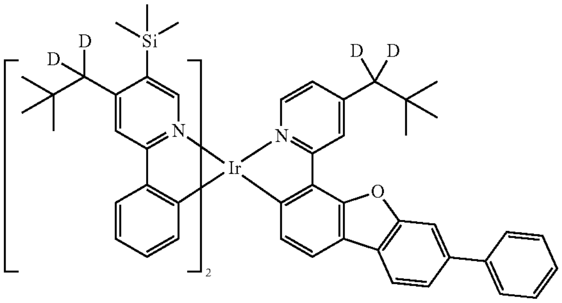
2407
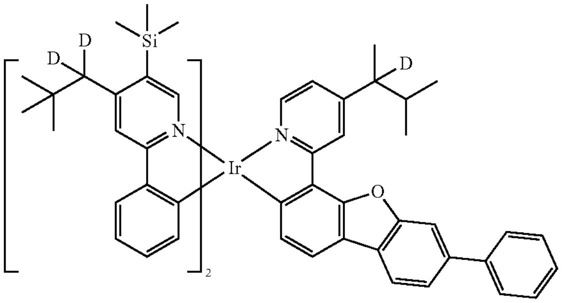
2408
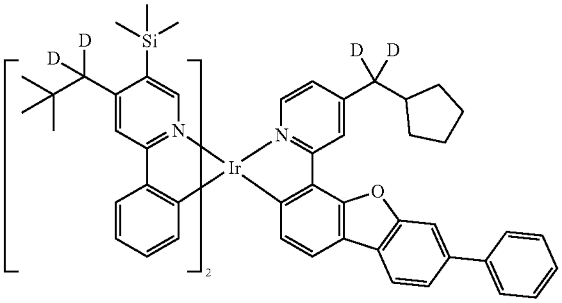
2409
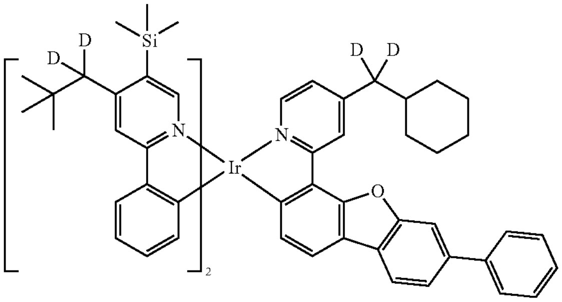

-continued
2410
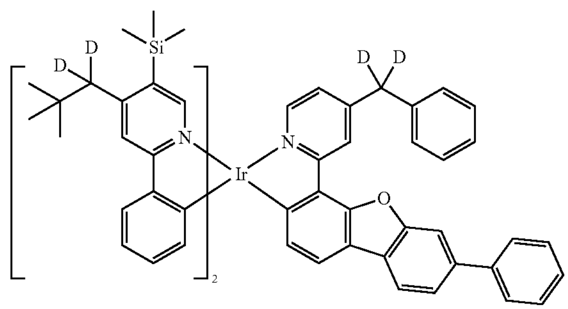
2411
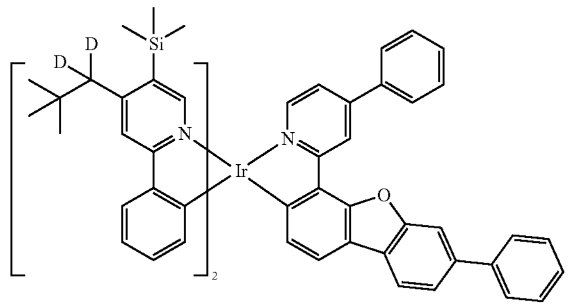
2412
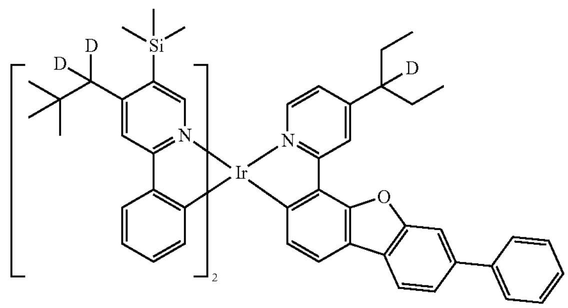
2413
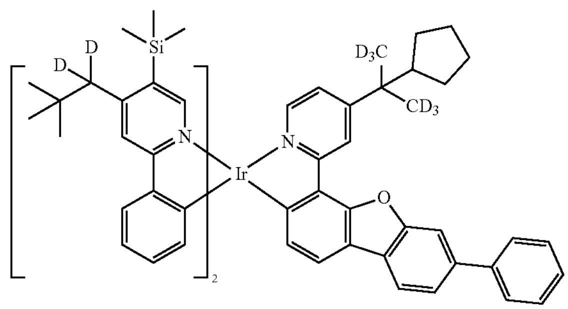
2414
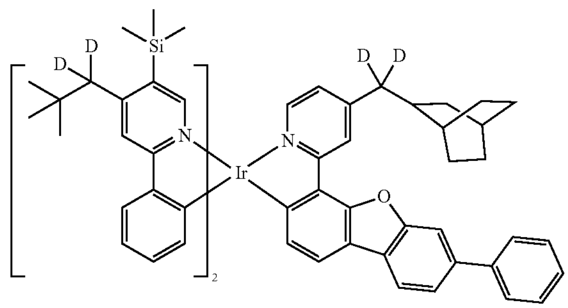
-continued
2415
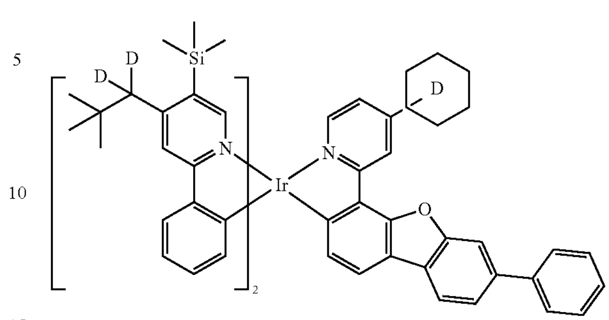
2416
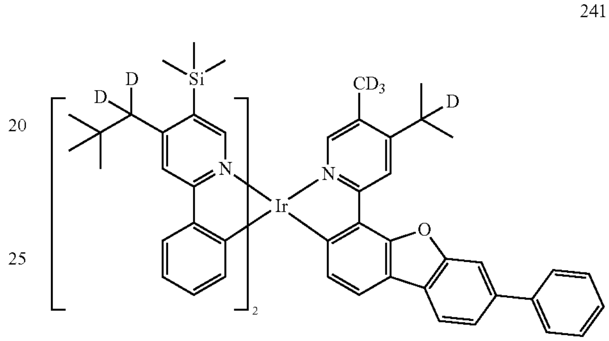
2417
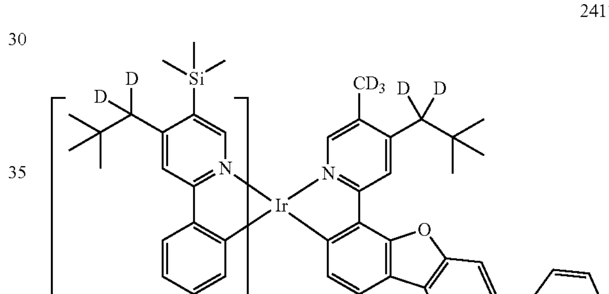
2418
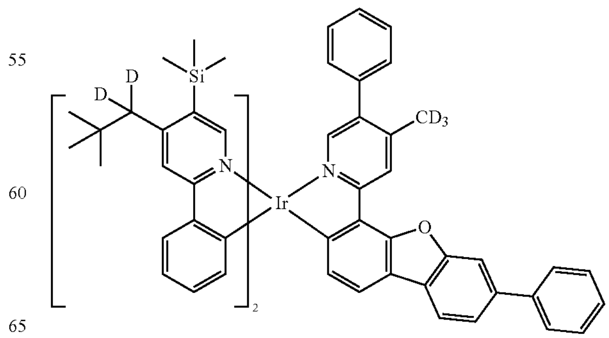

-continued
2419
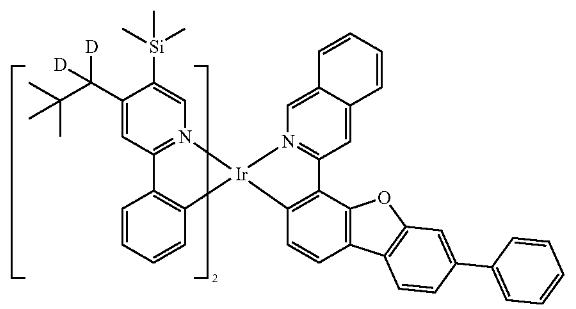
2420
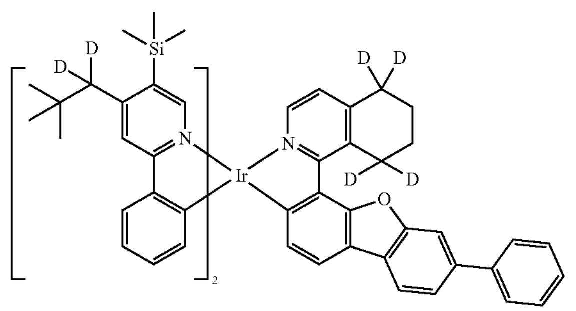
2421
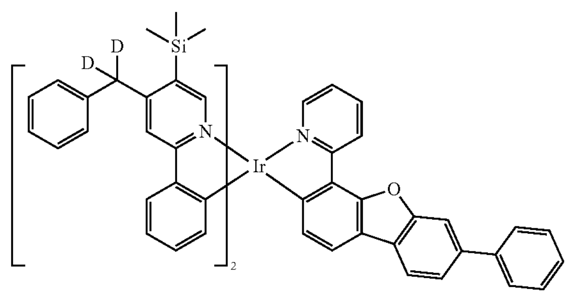
2422
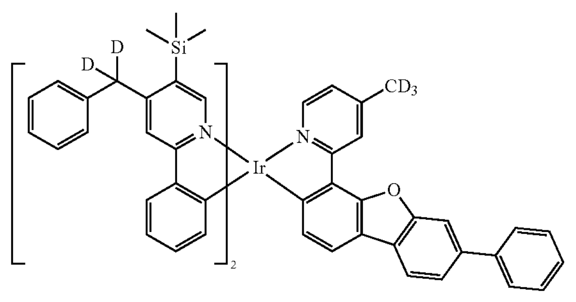
2423
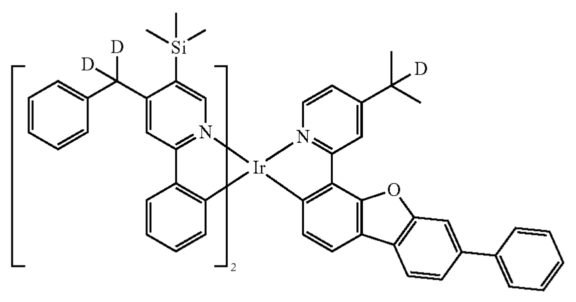
-continued
2424
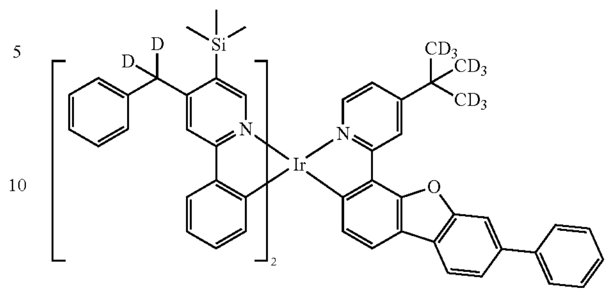
2425
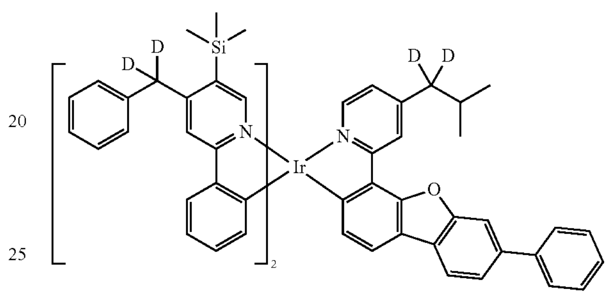
2426
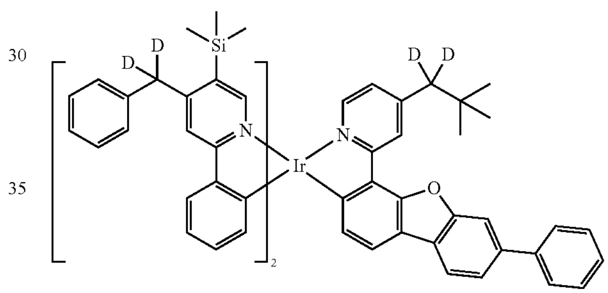
2427
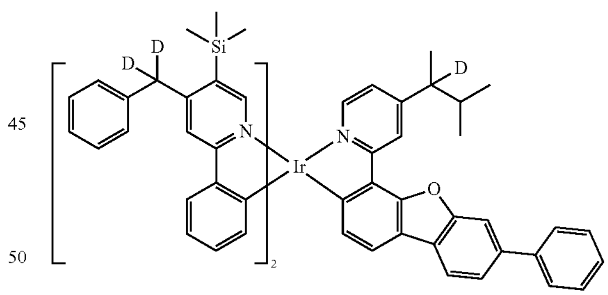
2428
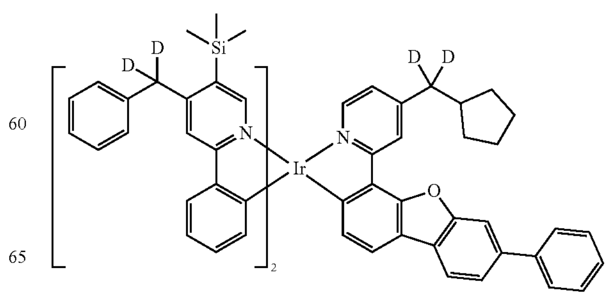

2429
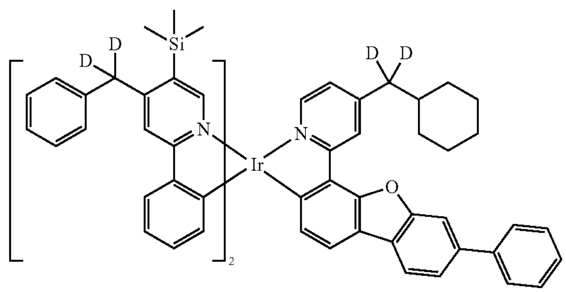
2430
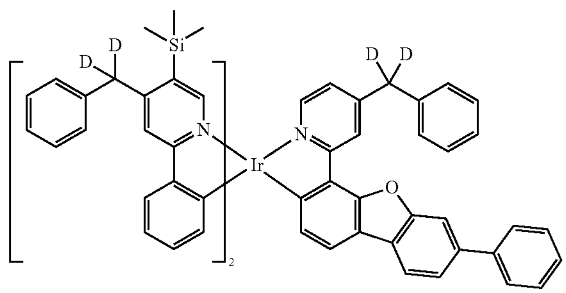
2431
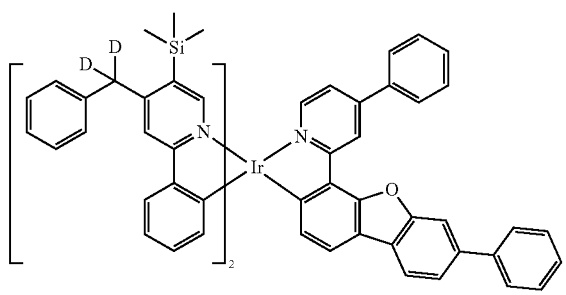
2432
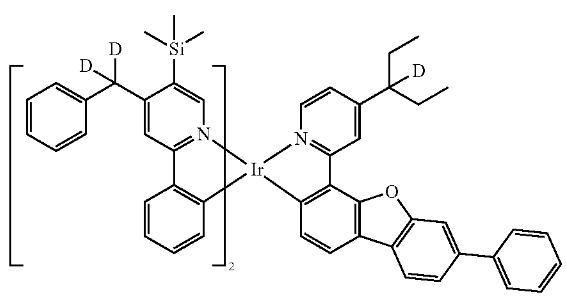
2433
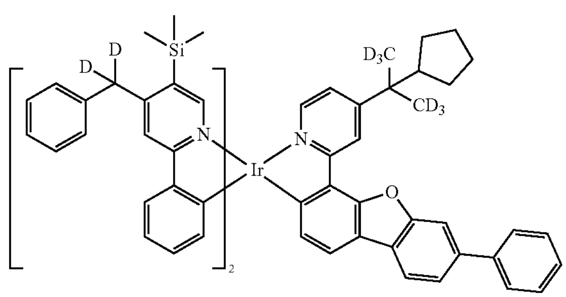
2434
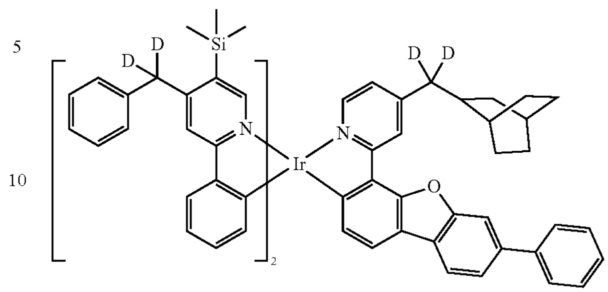
2435
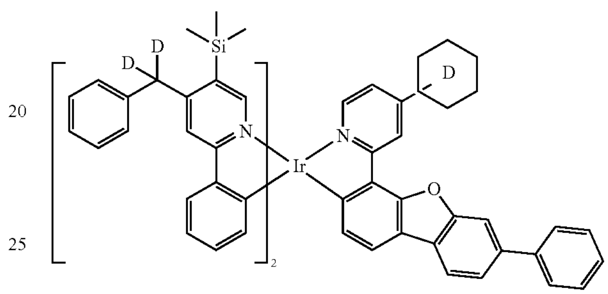
2436
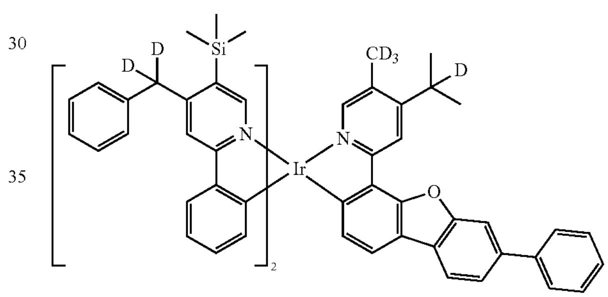
2437
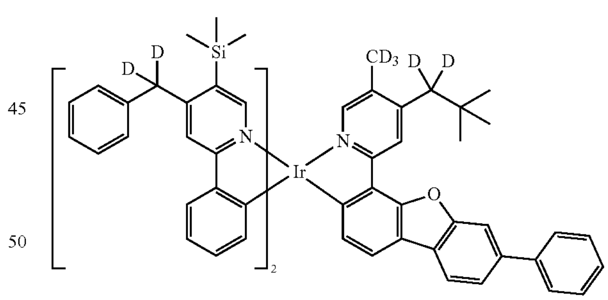
2438
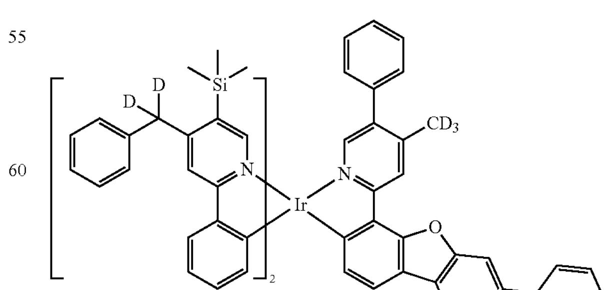

-continued
2439
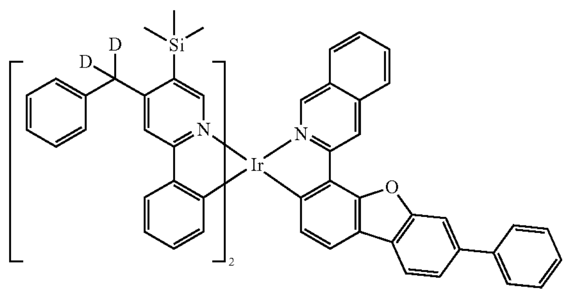
2440
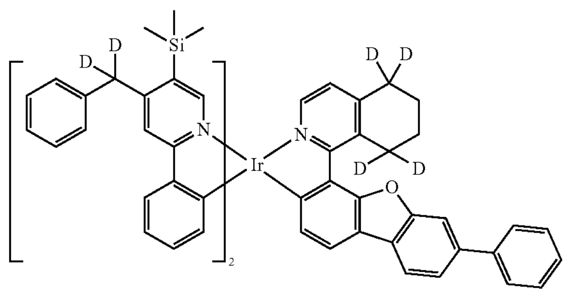
2441
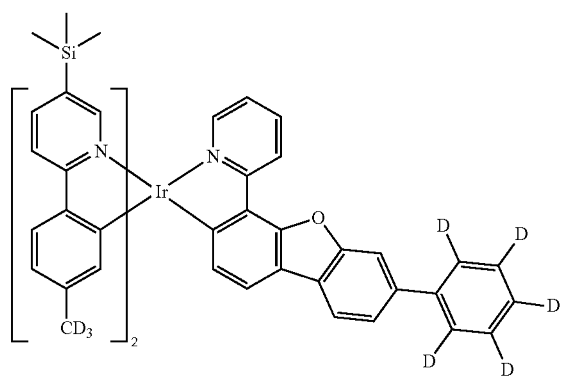
2442
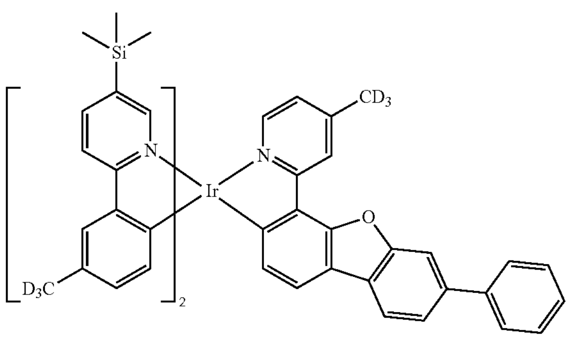
-continued
2443
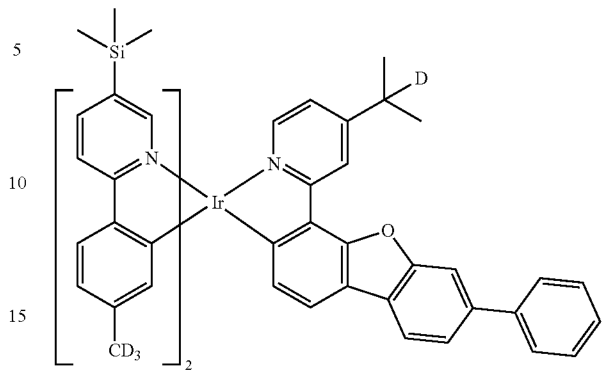
2444
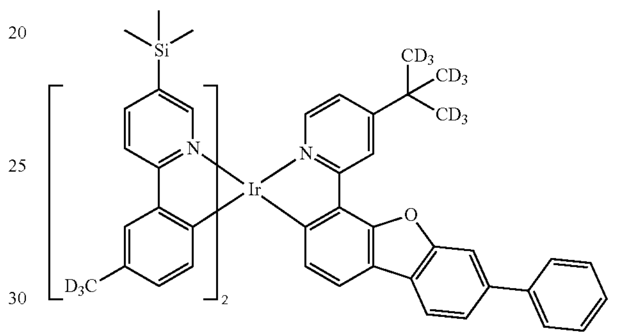
2445
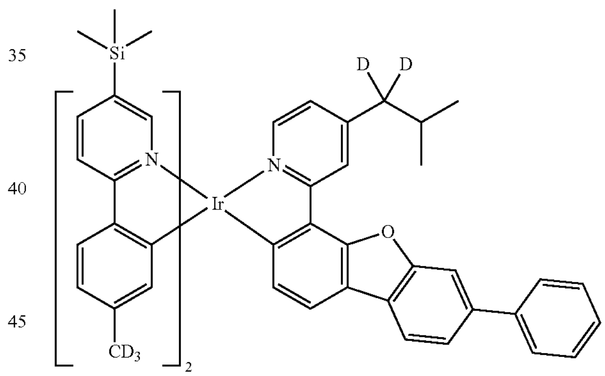
2446
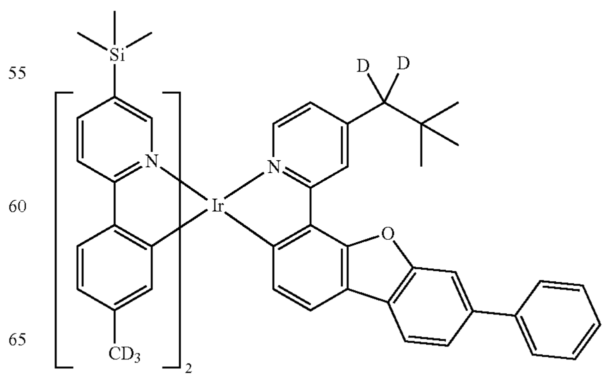

-continued
2447
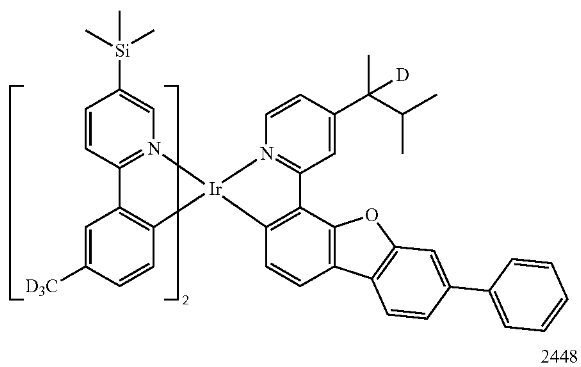
2448
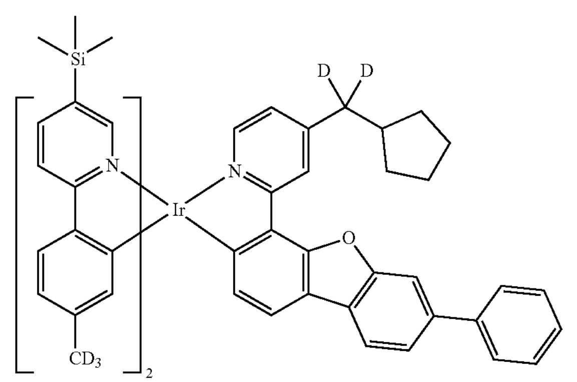
2449
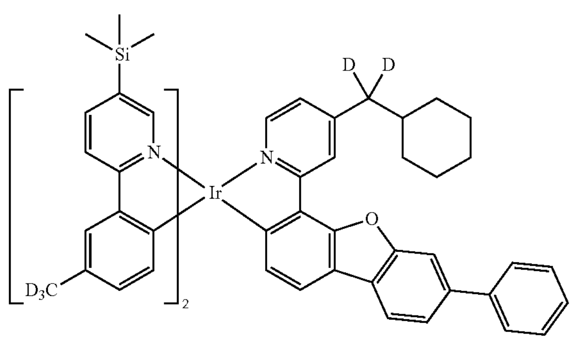
2450
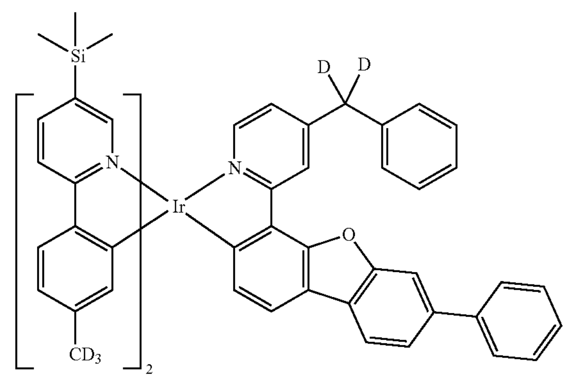
-continued
2451
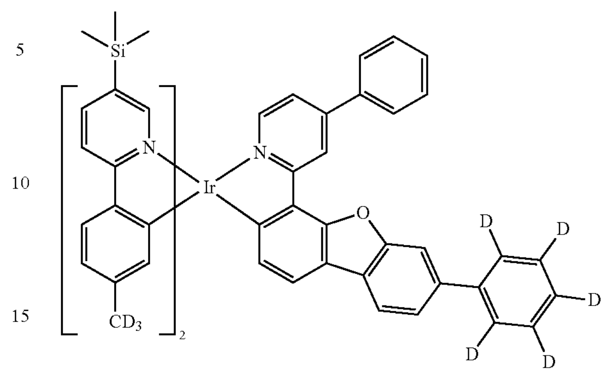
2452
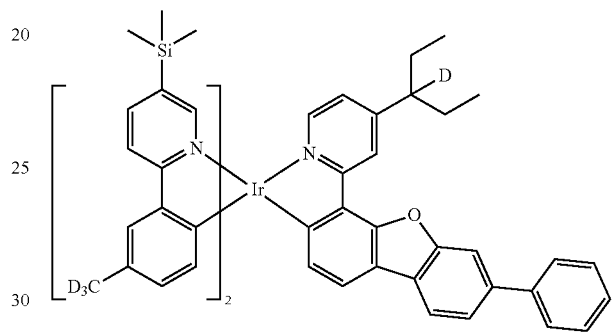
2453
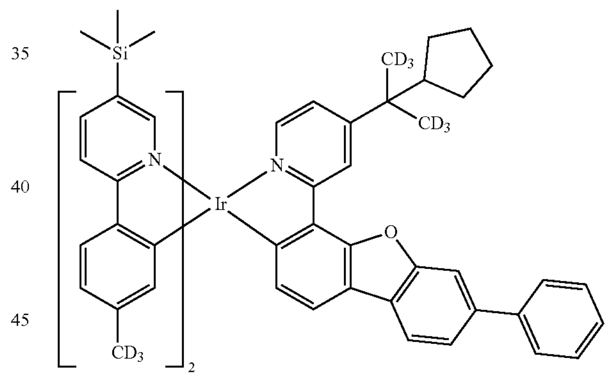
2454
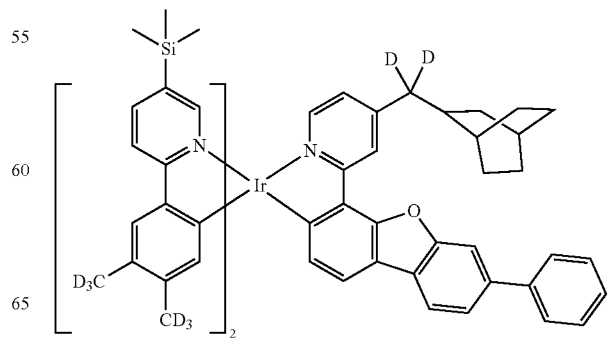

-continued
2455
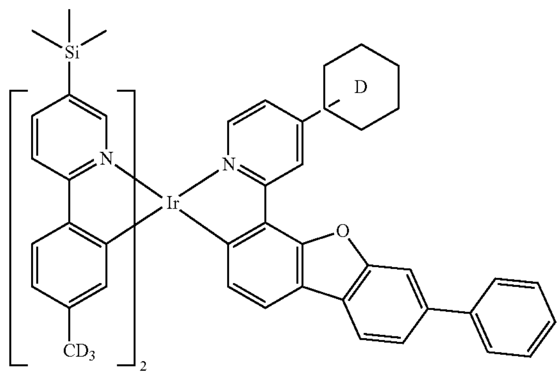
2456
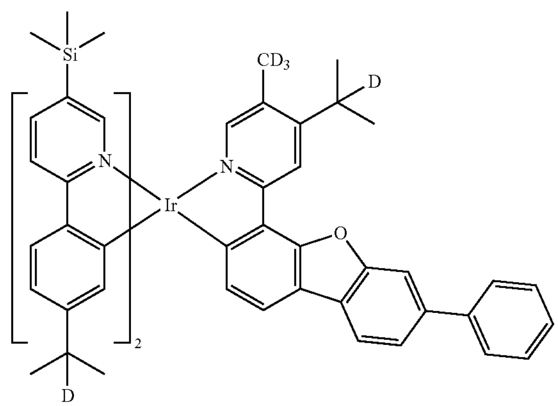
2457
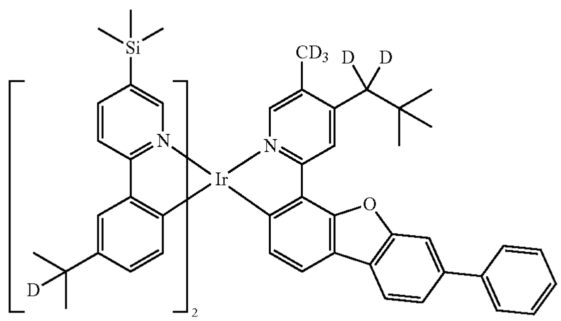
2458
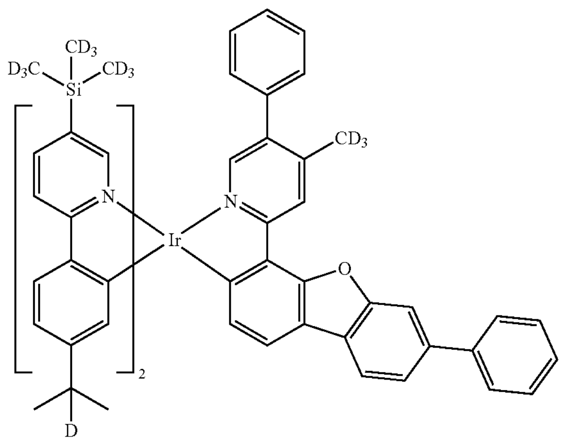
-continued
2459
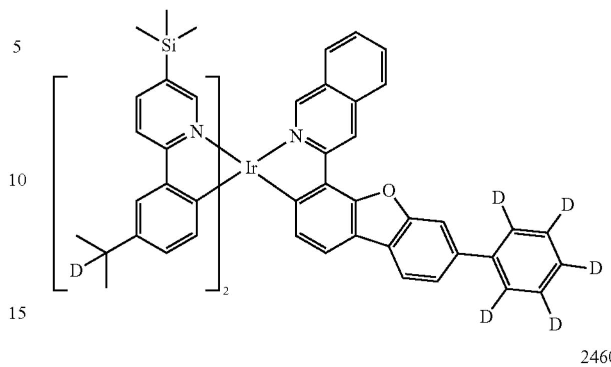
2460
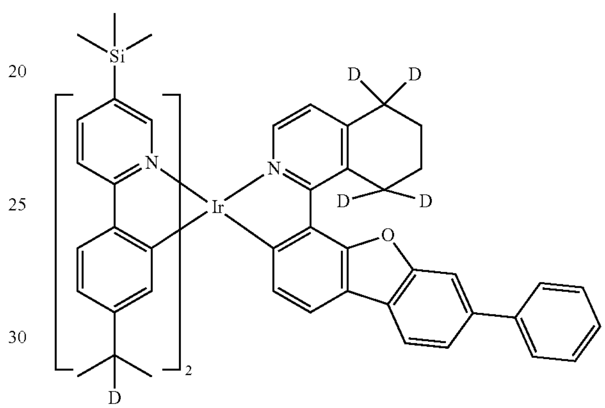
2461
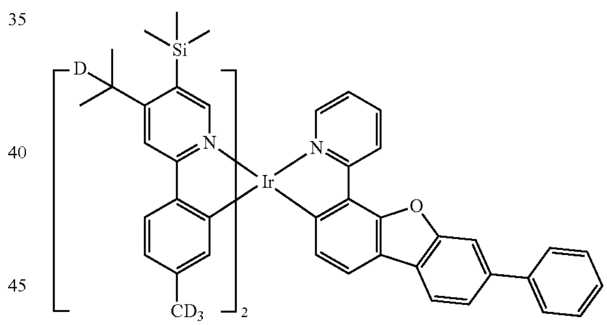
2462
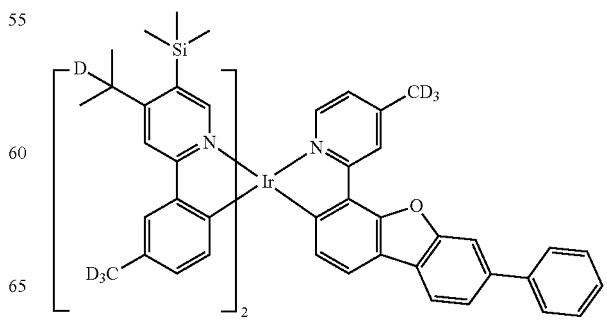

-continued
2463
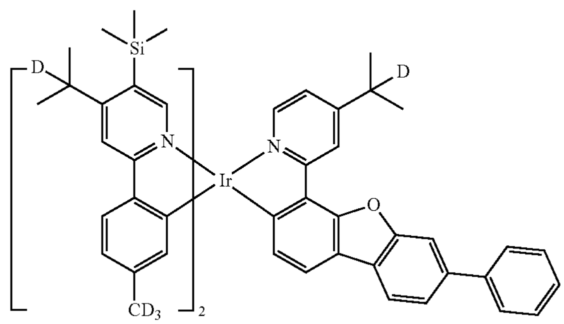
2464
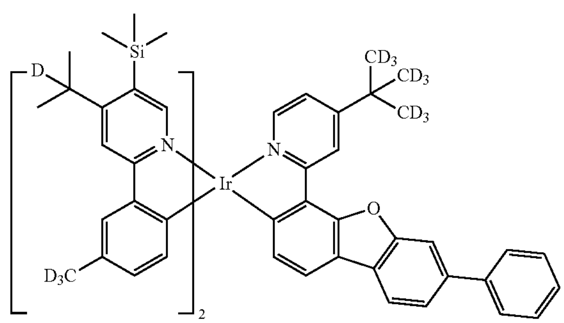
2465
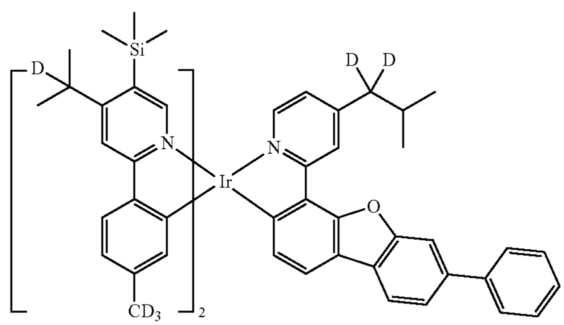
2466
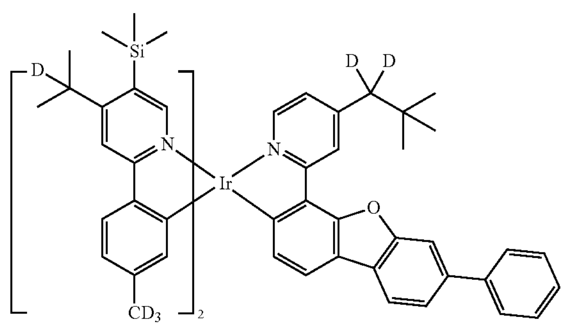
-continued
2467
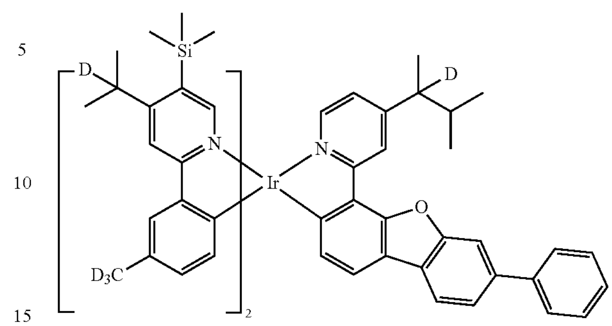
2468
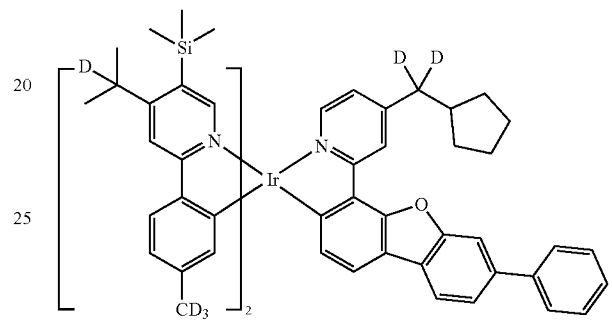
2469
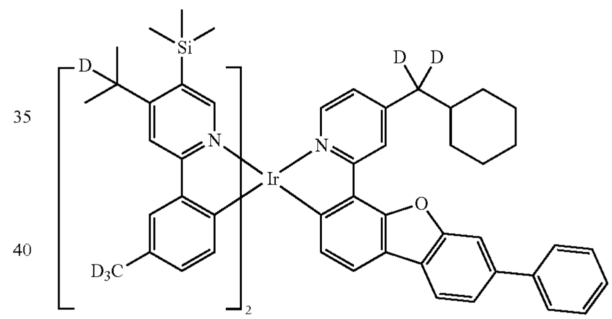
2470
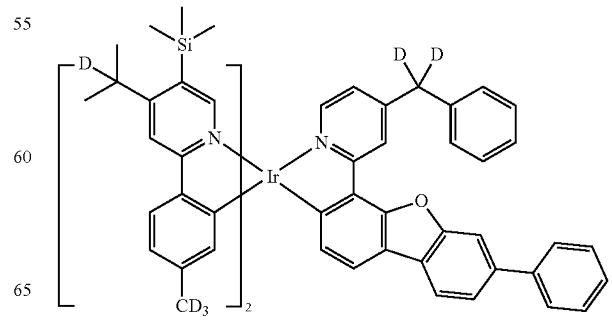

-continued
2471
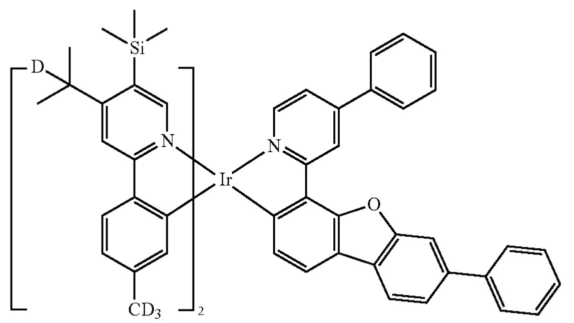
2472
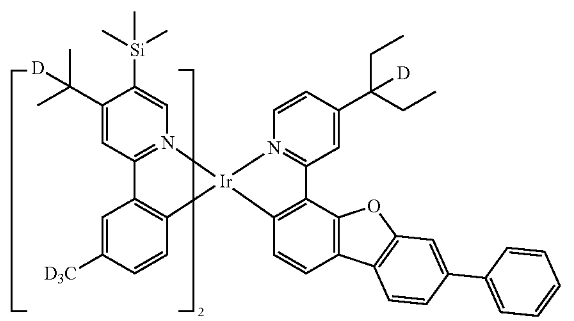
2473
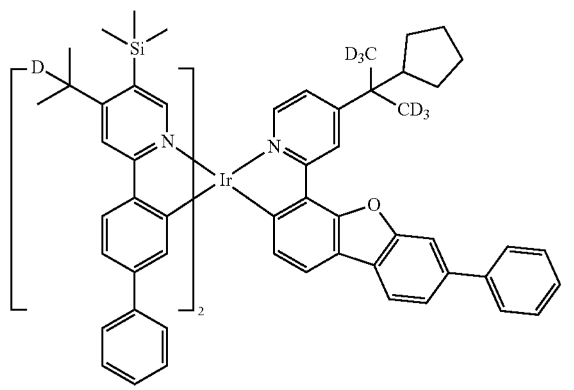
2474
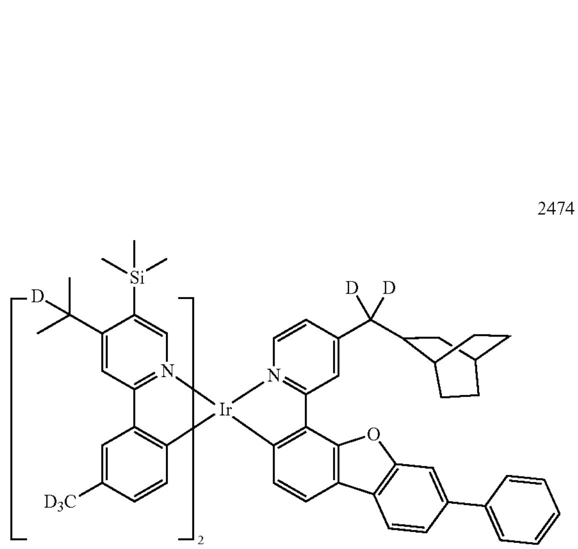
-continued
2475
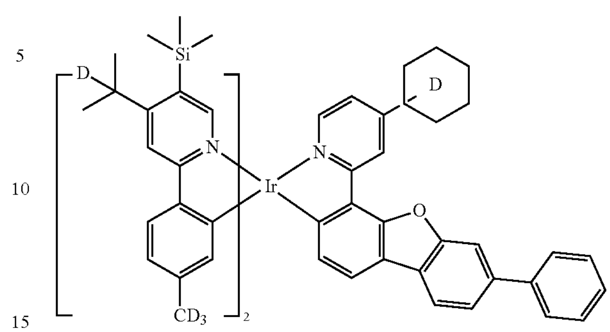
2476
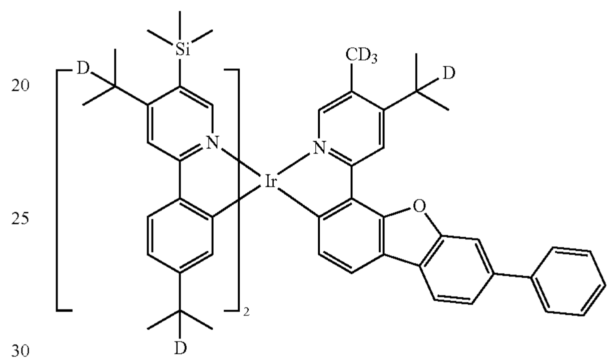
2477
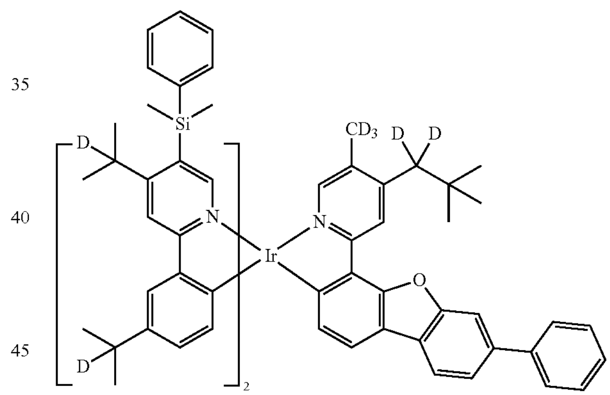
2478
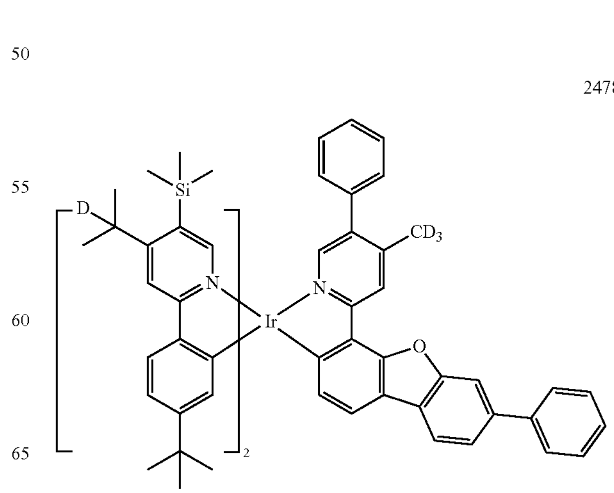

-continued
2479
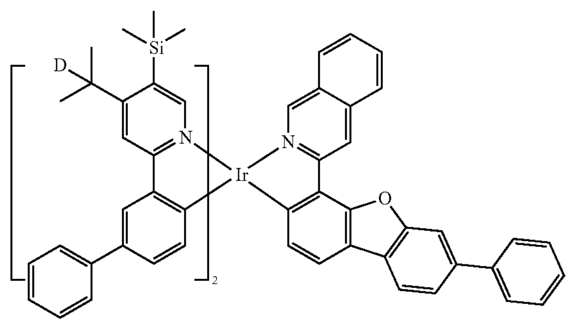
2480
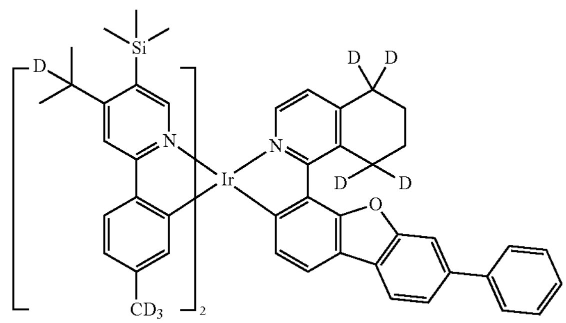
2481
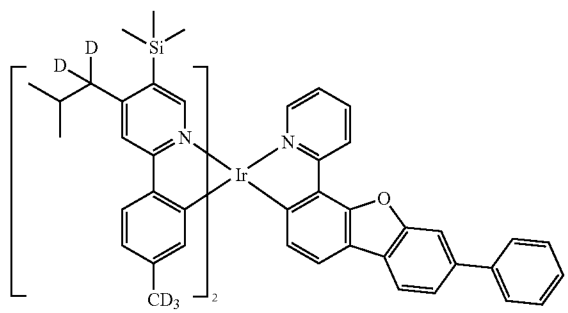
2482
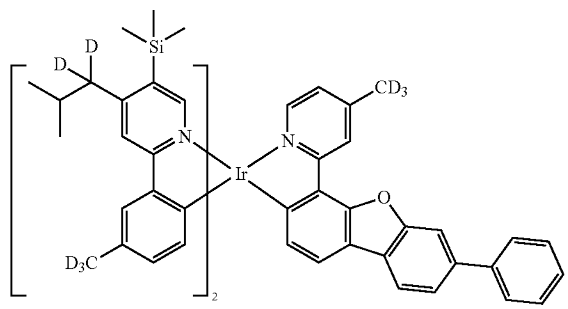
-continued
2483
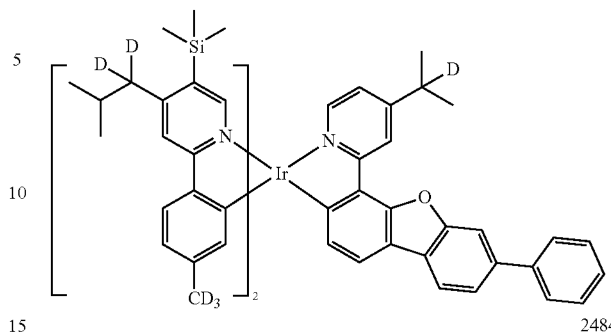
2484
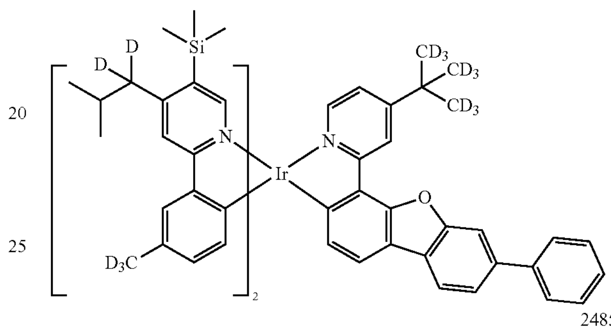
2485
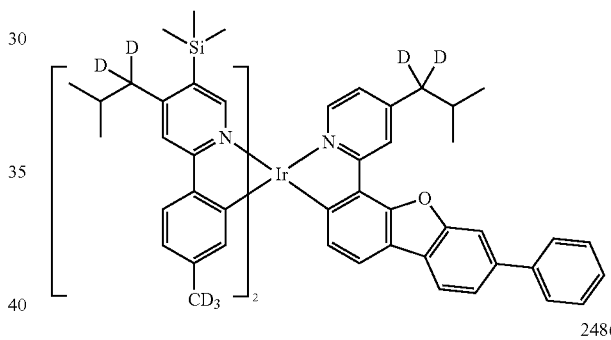
2486
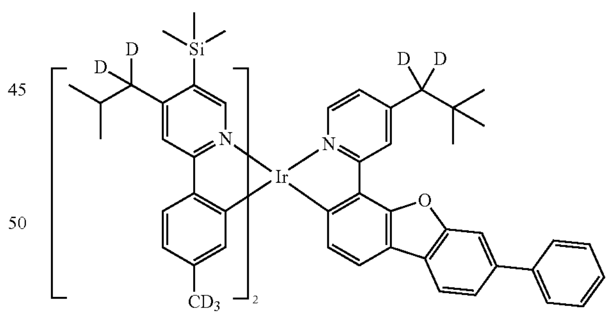
2487
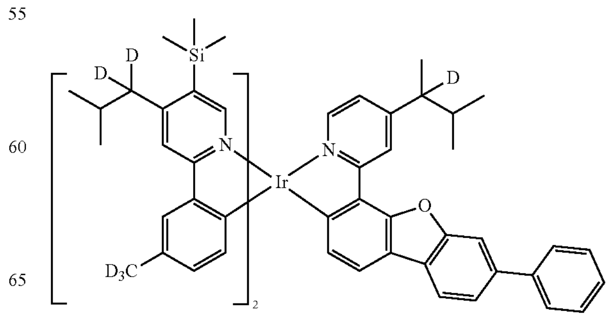

-continued
2488
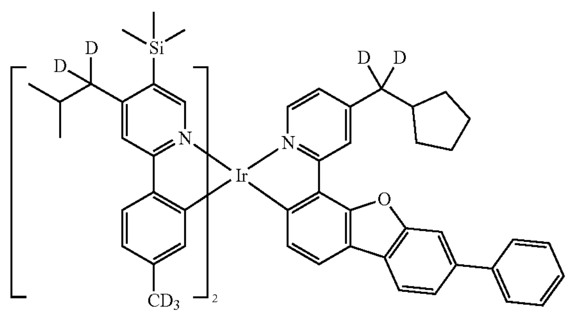
2489
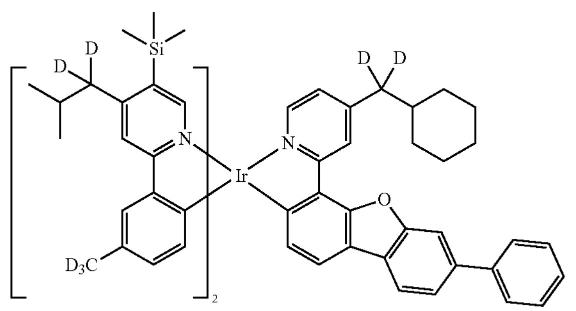
2490
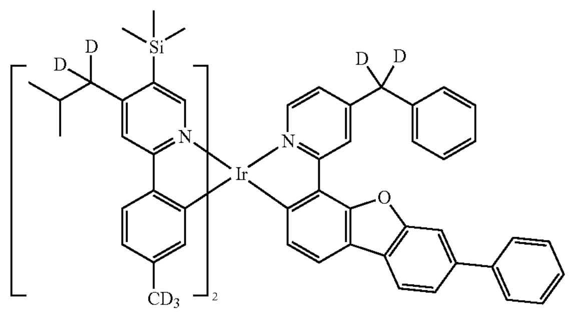
2491
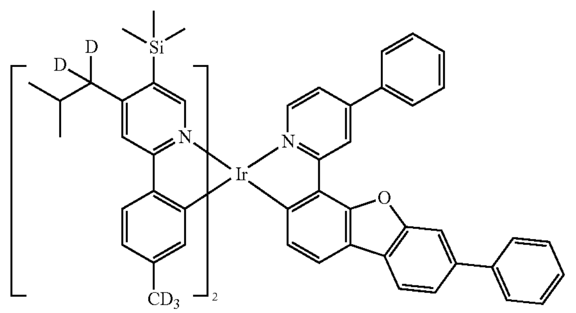
-continued
2492
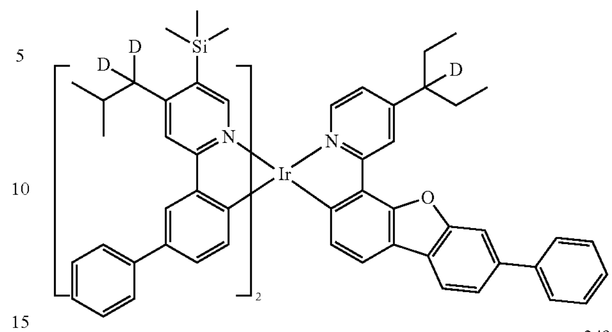
2493
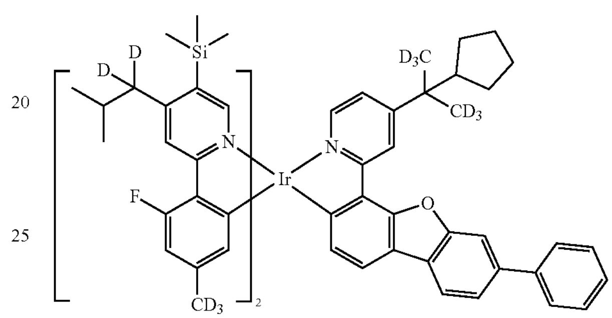
2494
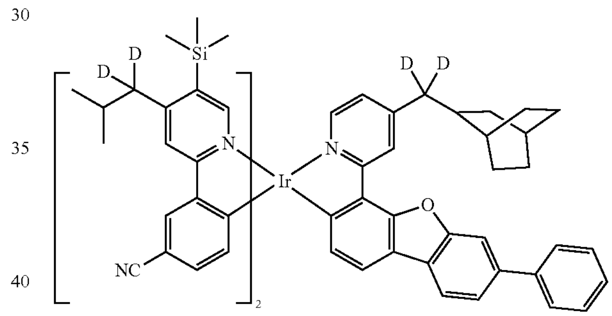
2495
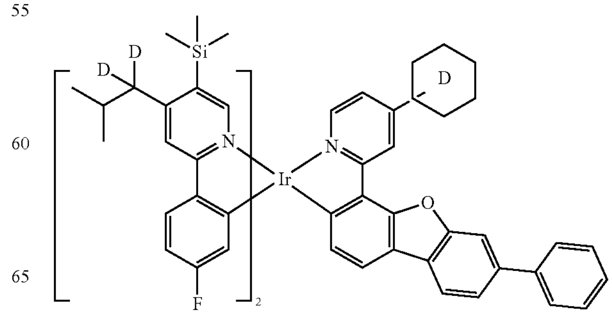

2496
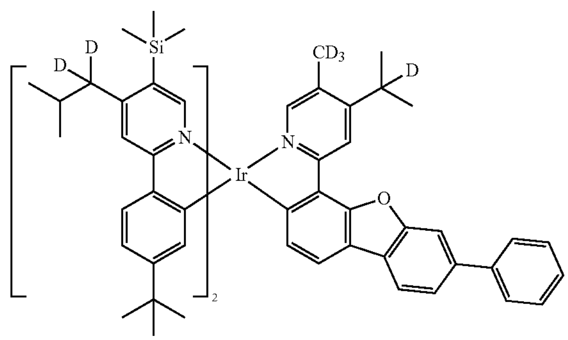
2497
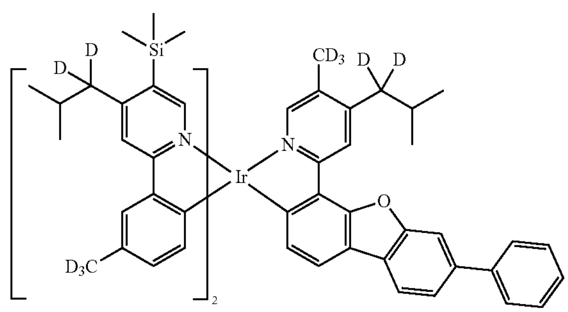
2498
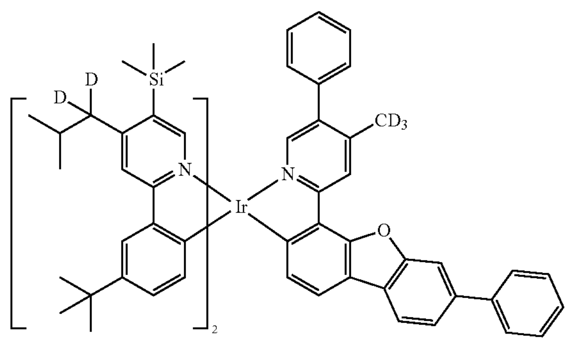
2499
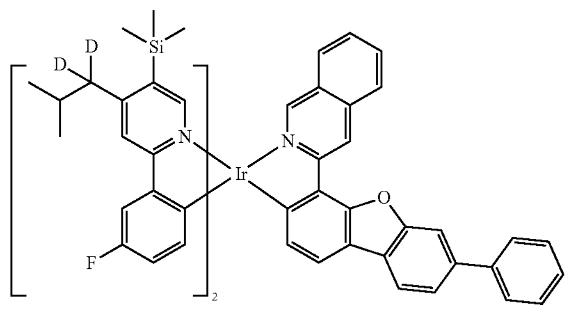
2500
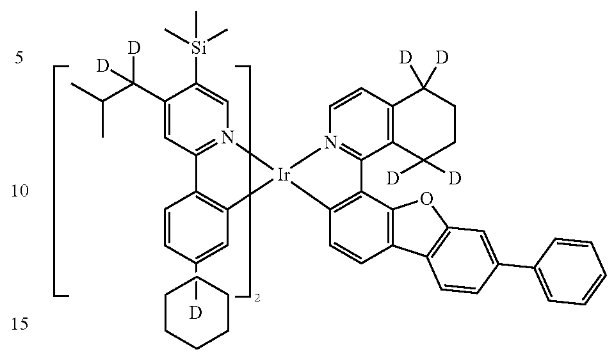
2501
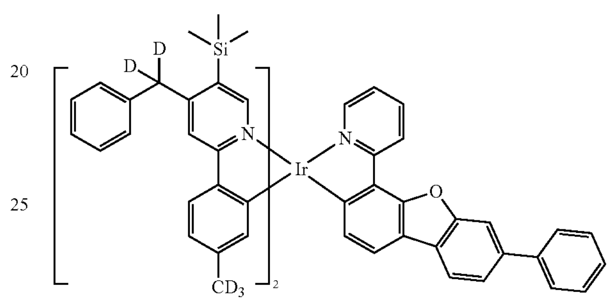
2502
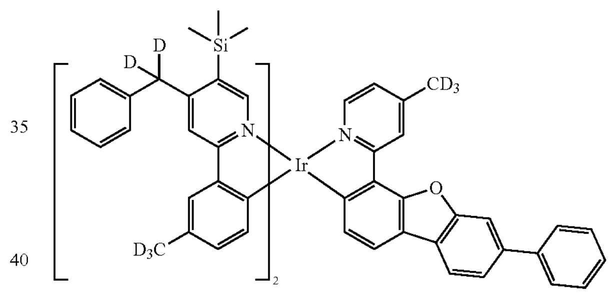
2503
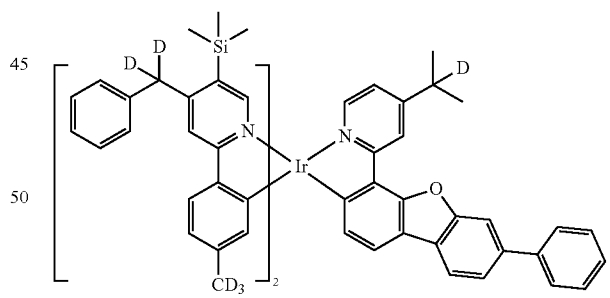
2504
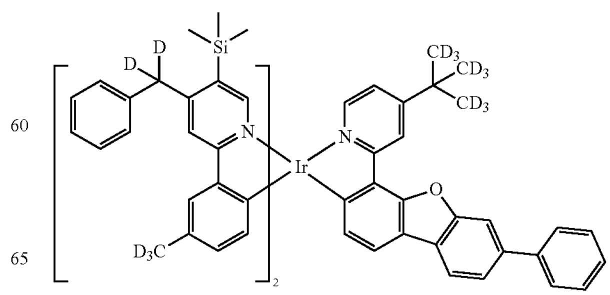

-continued
2505
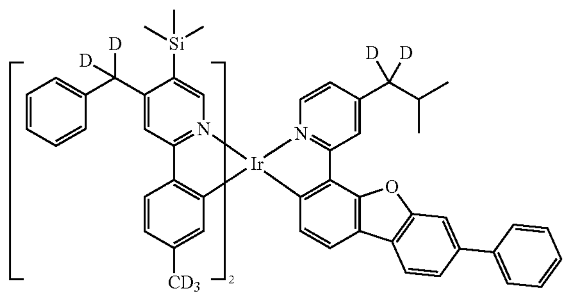
2506
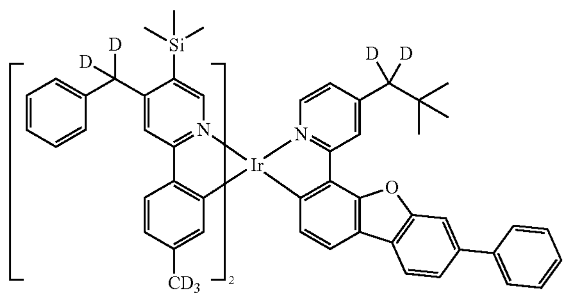
2507
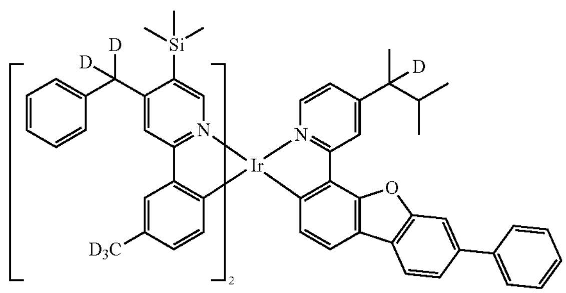
2508
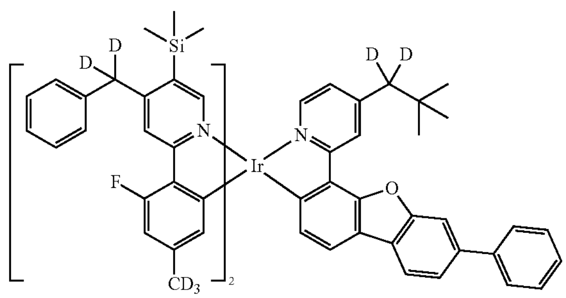
2509
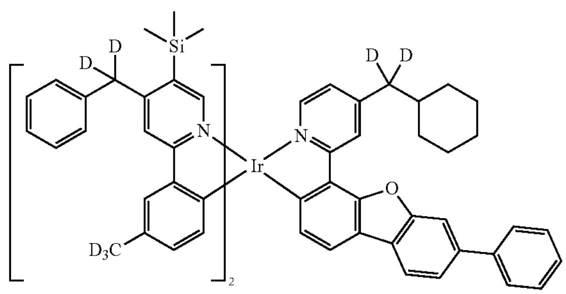
-continued
2510
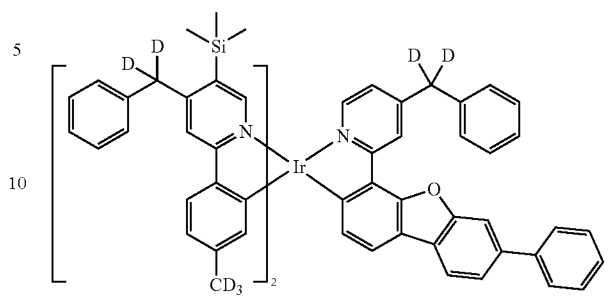
2511
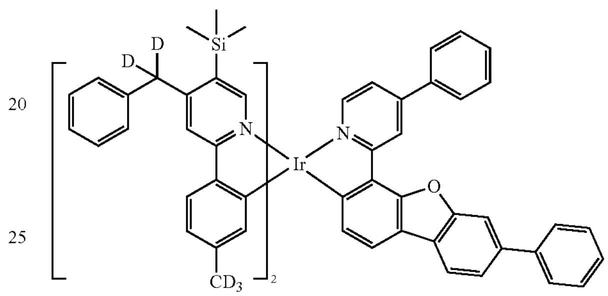
2512
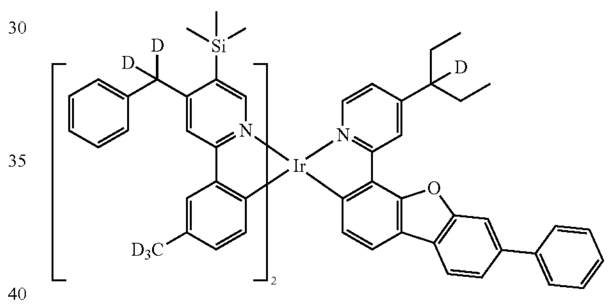
2513
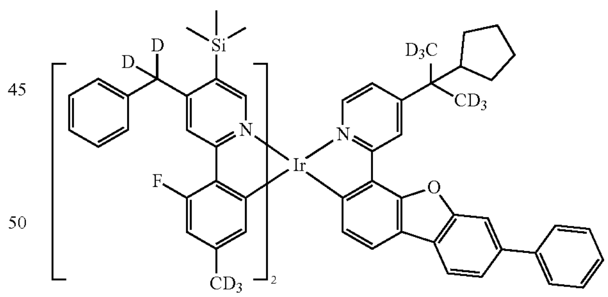
2514
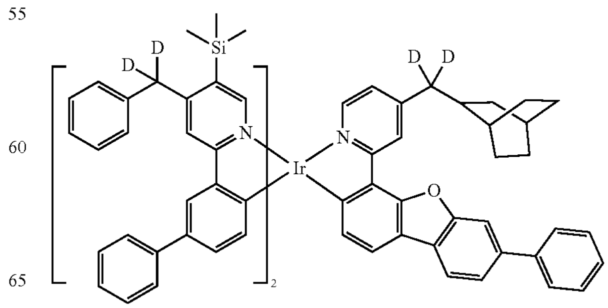

-continued
2515 
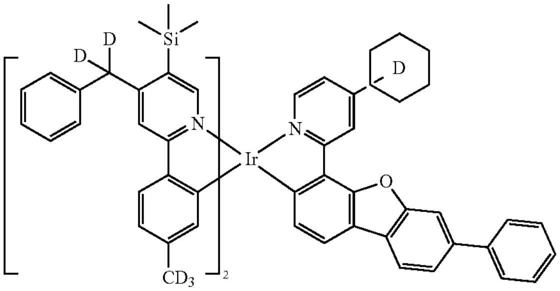
2516 
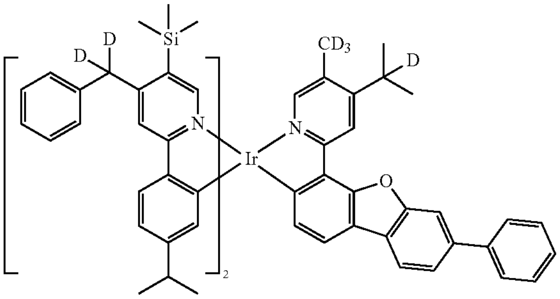
2517 
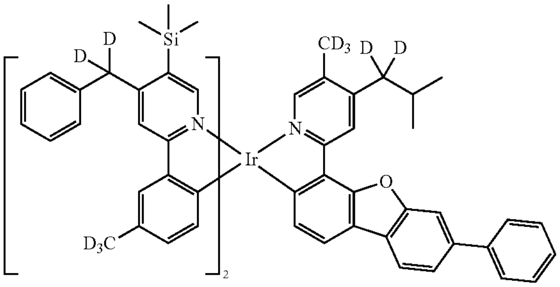
-continued 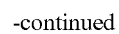
2518 
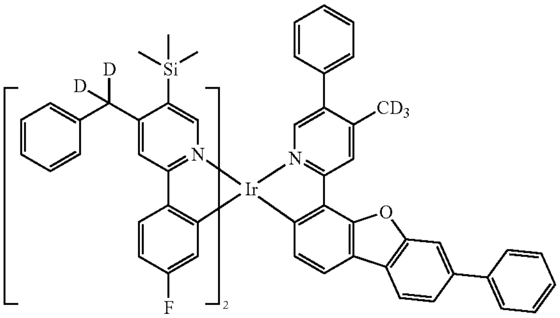
2519 
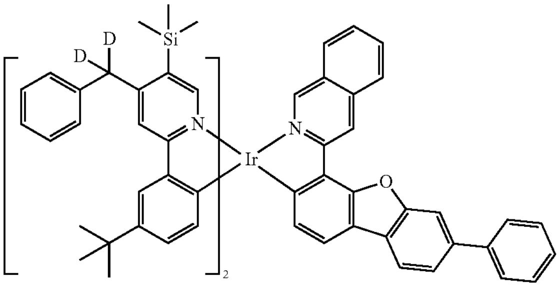
2520 
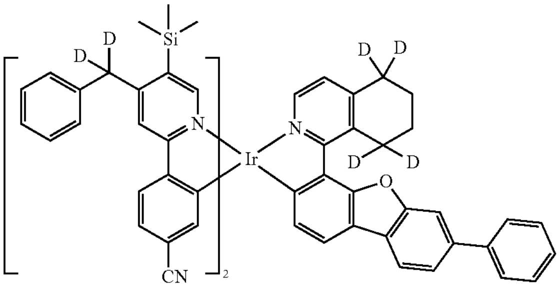

2521
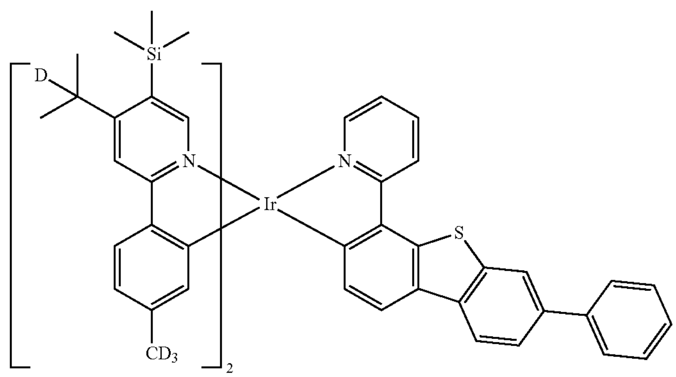
2522
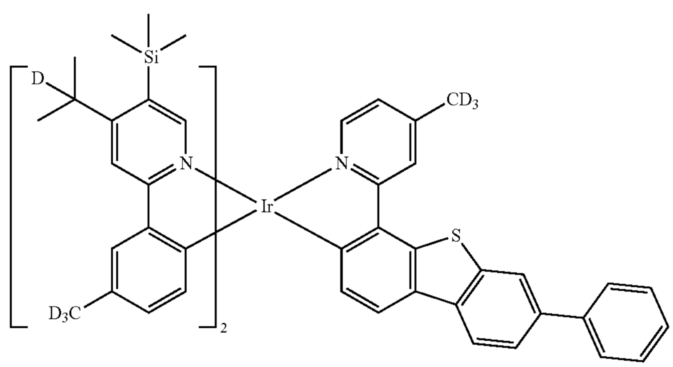
2523
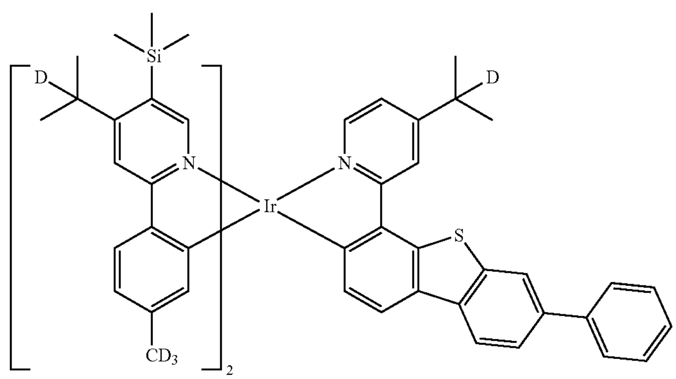
2524
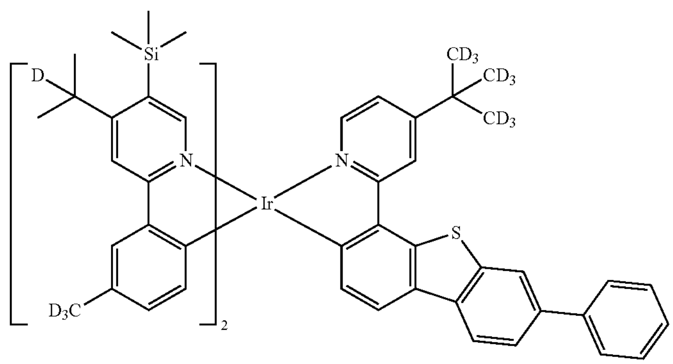

-continued
2525
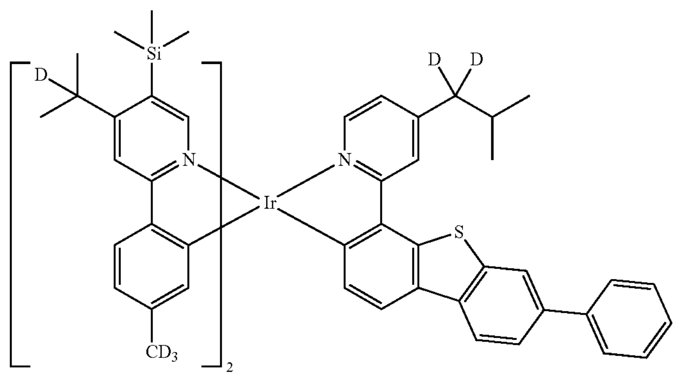
2526
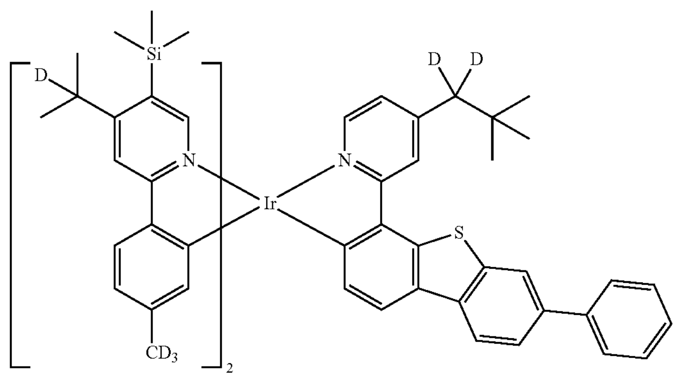
2527
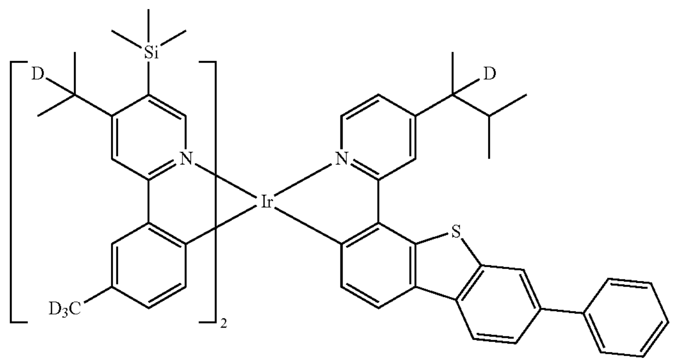
2528
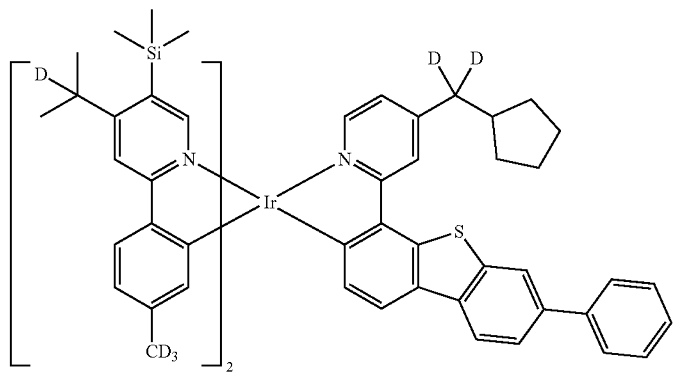

-continued
2529
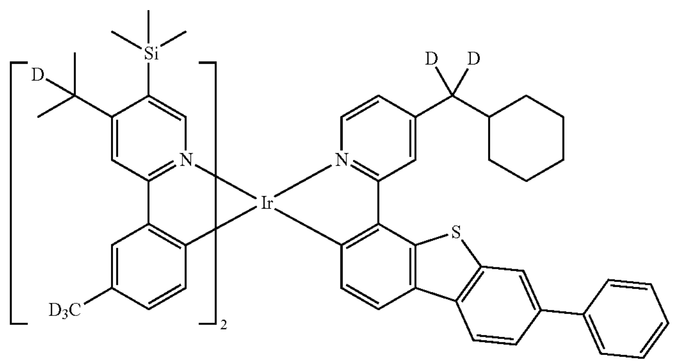
2530
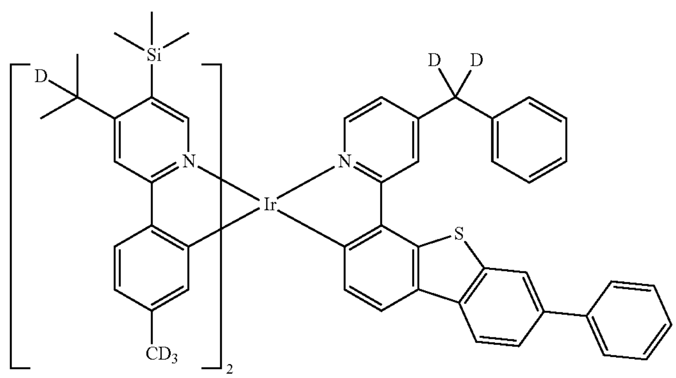
2531
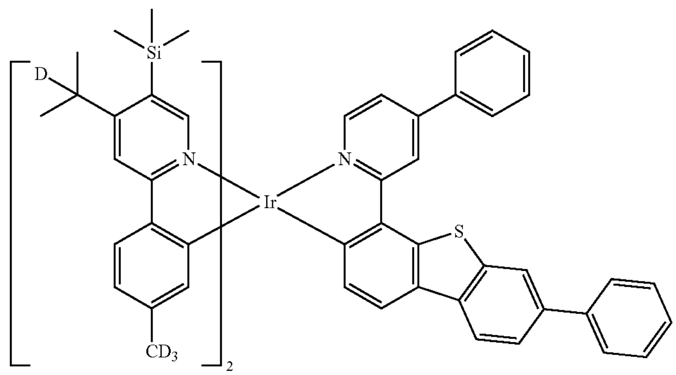
2531
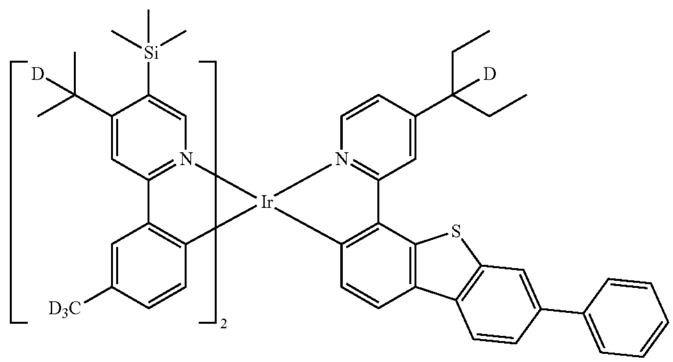

-continued
2533
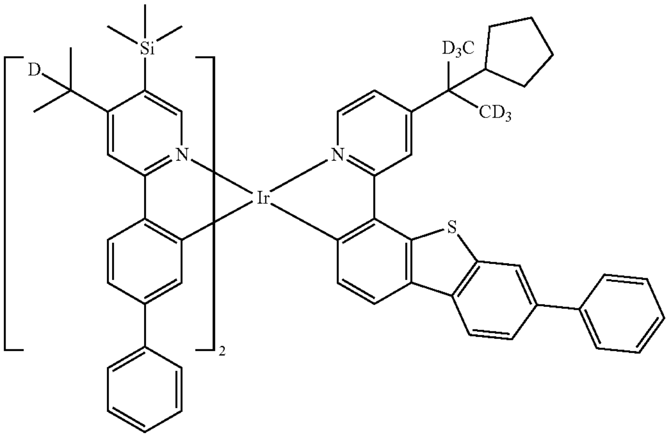
2534
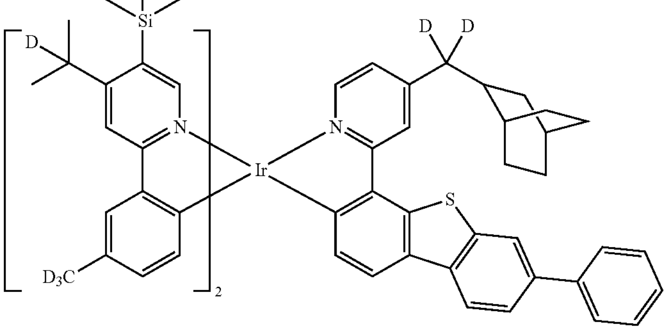
2535
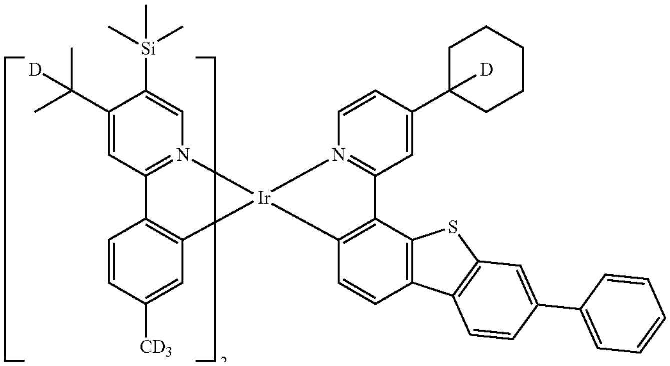
2536
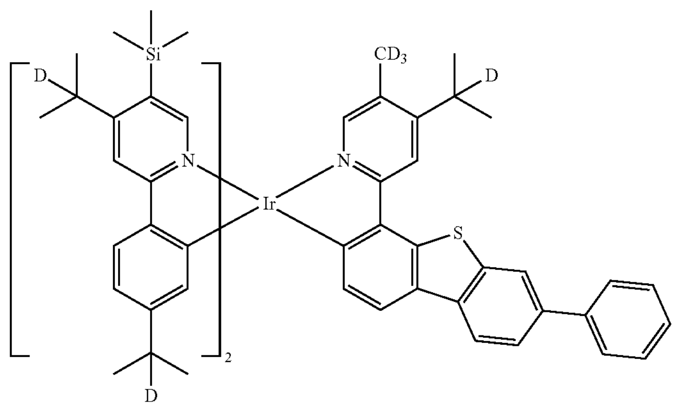

-continued
2537
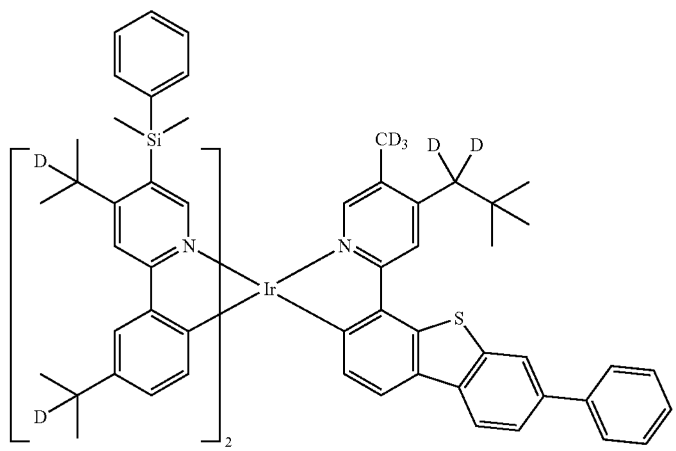
2538
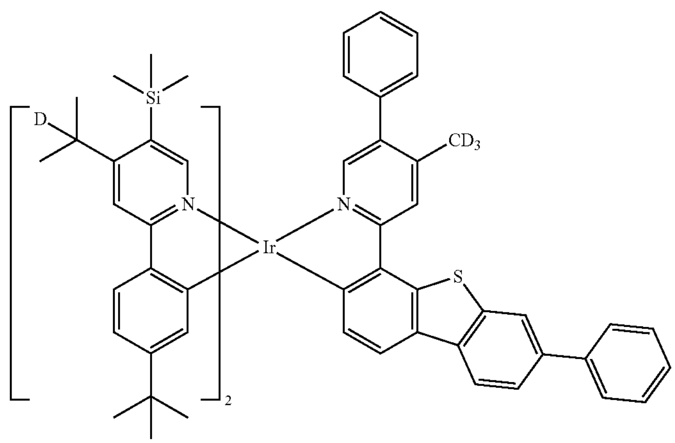
2539
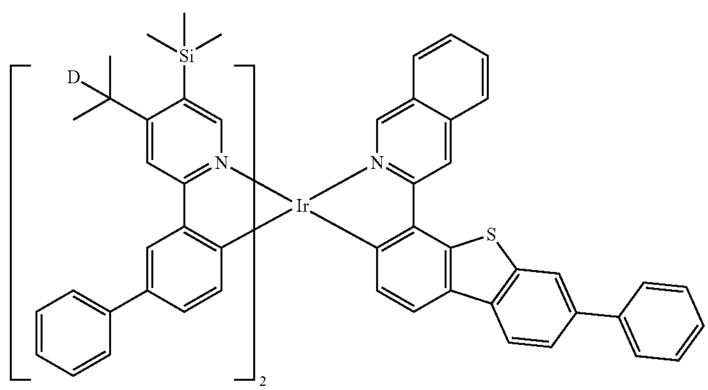
2540
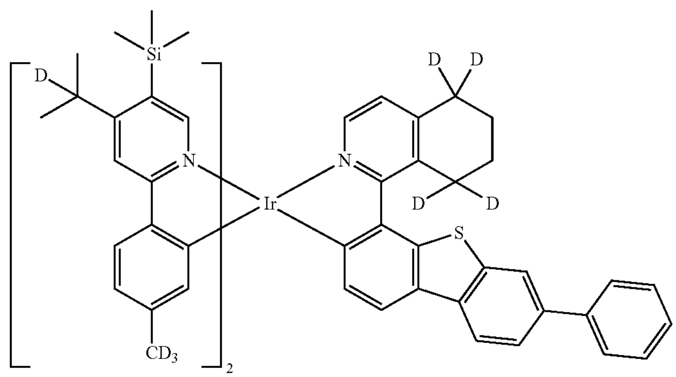

-continued
2541
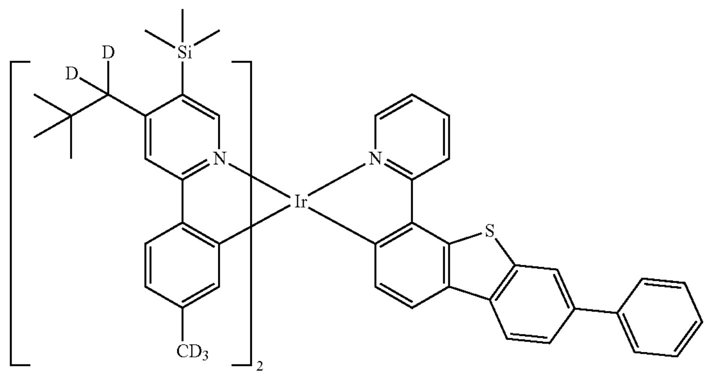
2542
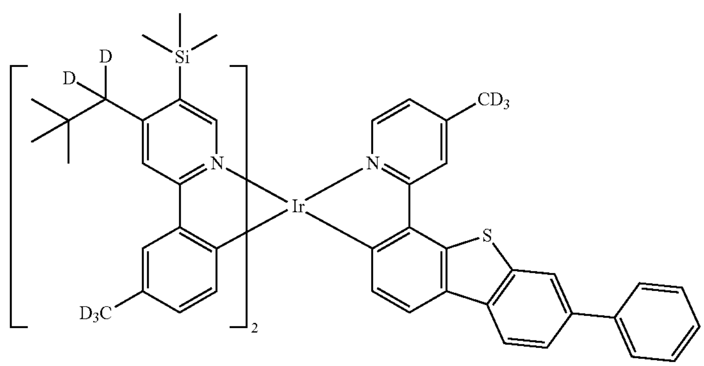
2543
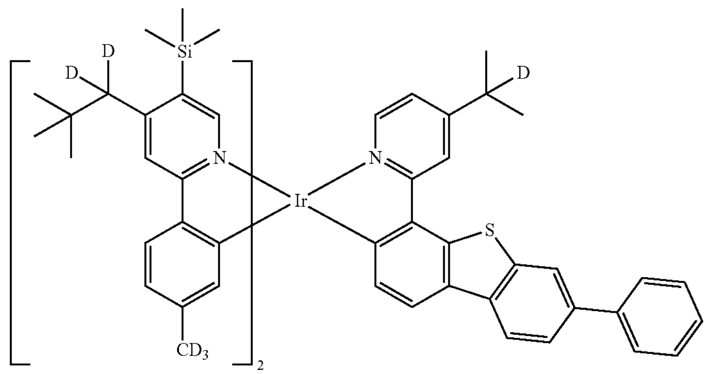
2544
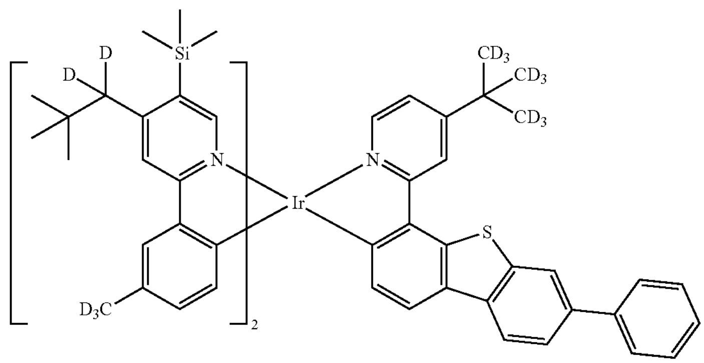

-continued
2545
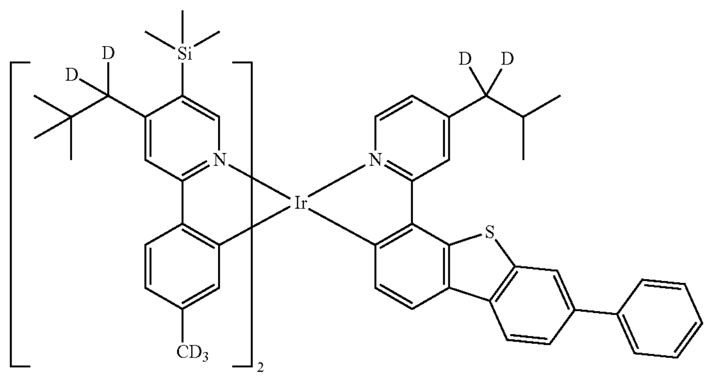
2546
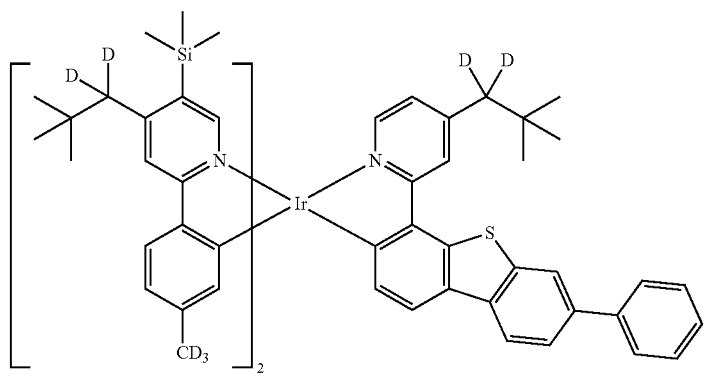
2547
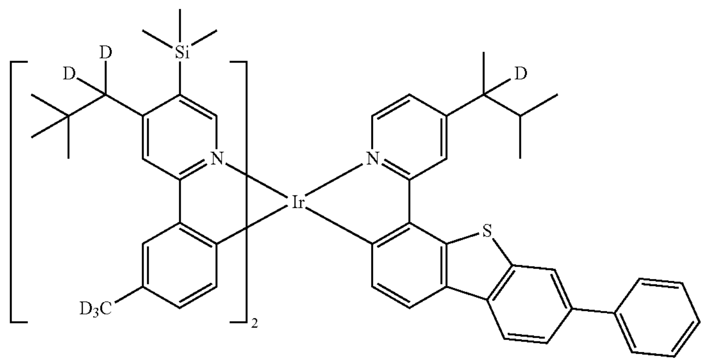
2548
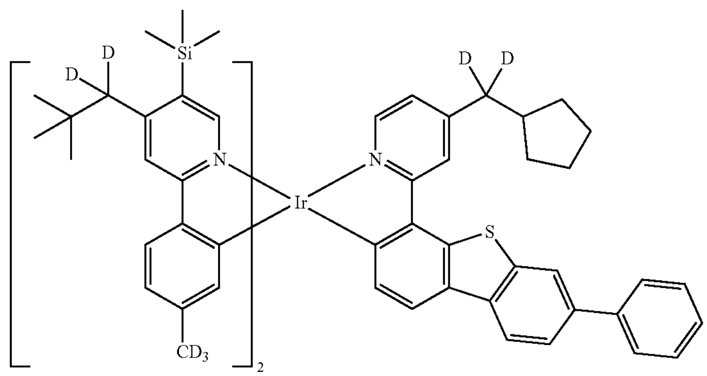

-continued
2549
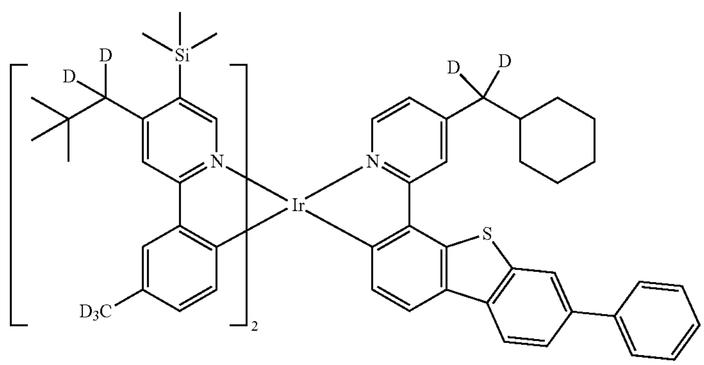
2550
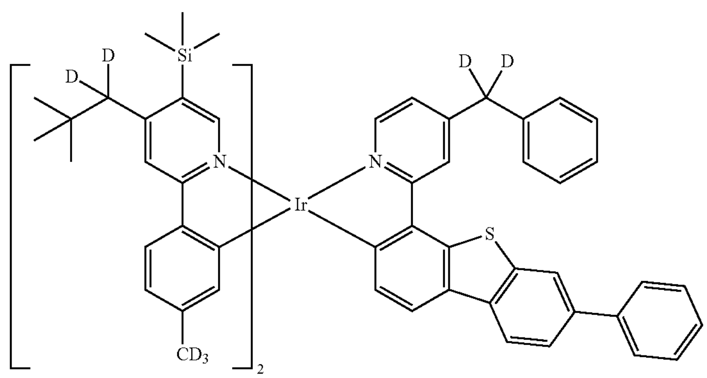
2551
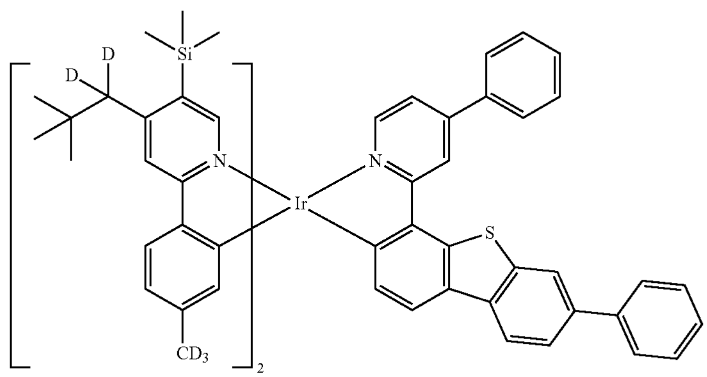
2552
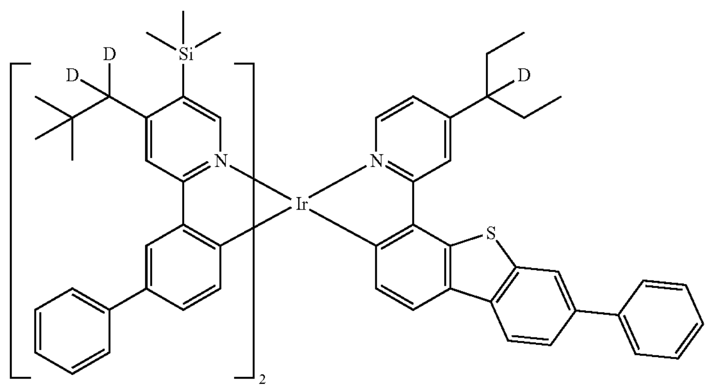

-continued
2553
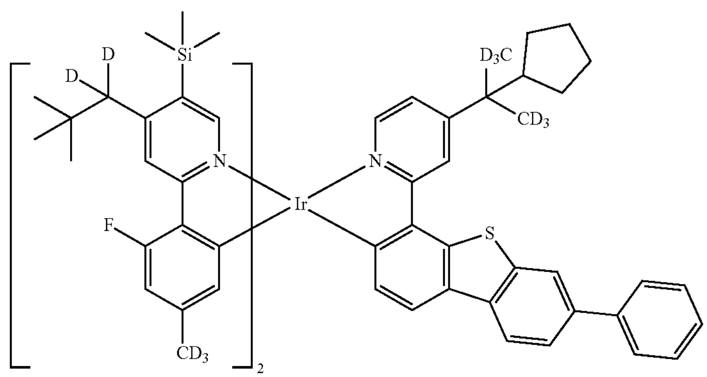
2554
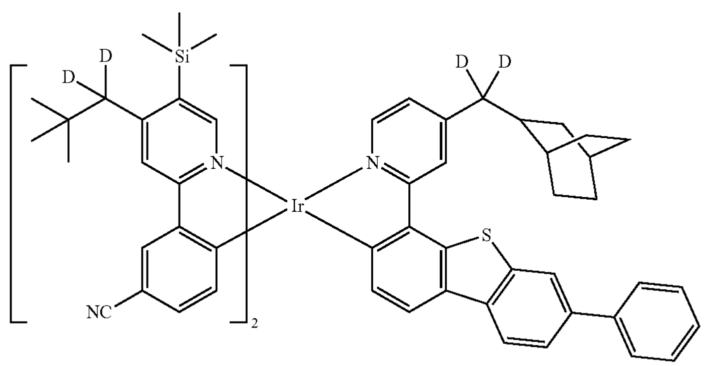
2555
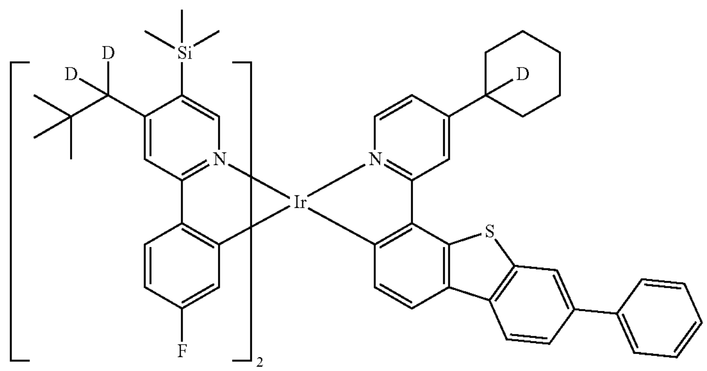
2556
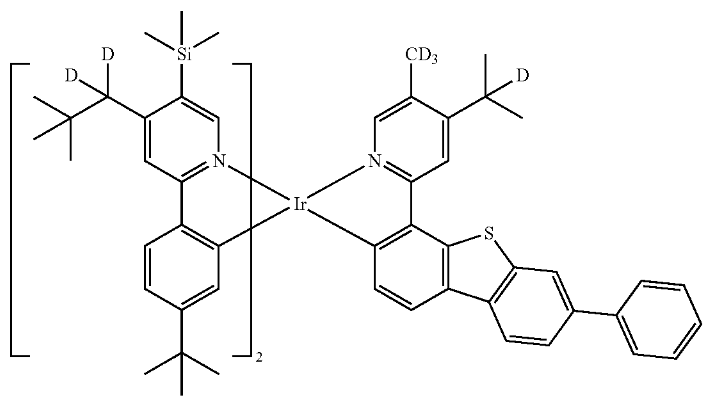

-continued
2557
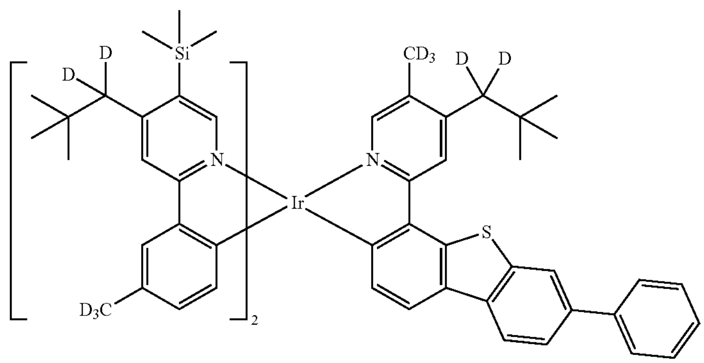
2558
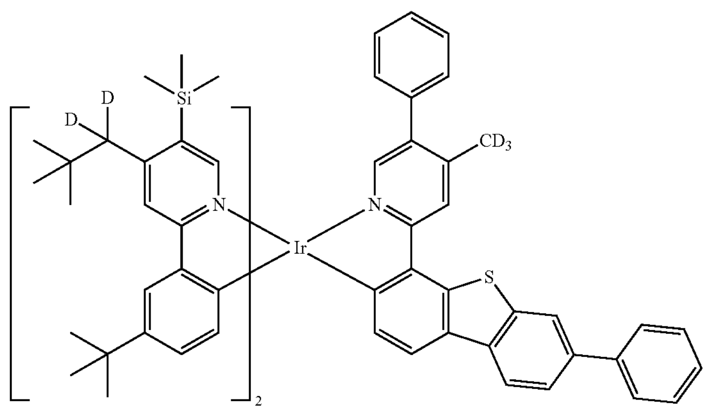
2559
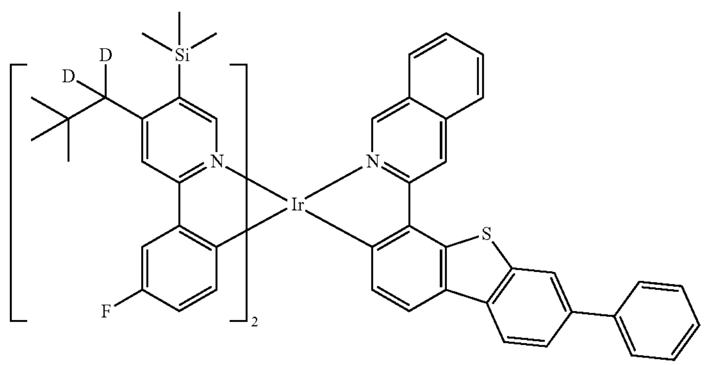
2560
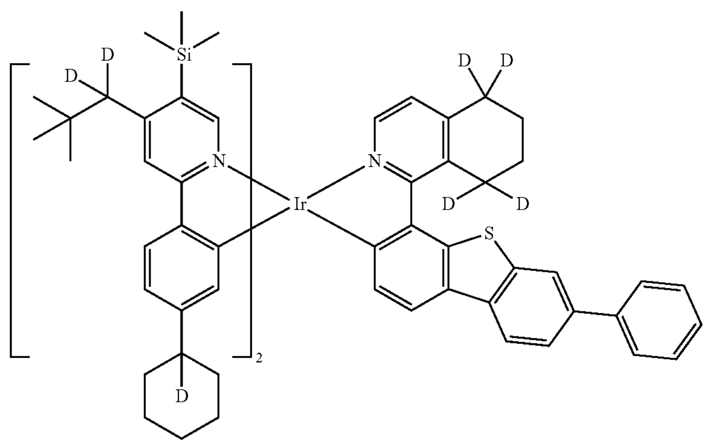

-continued
2561
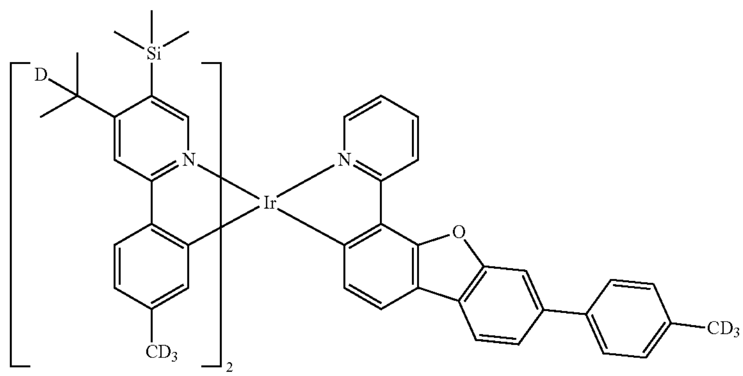
2562
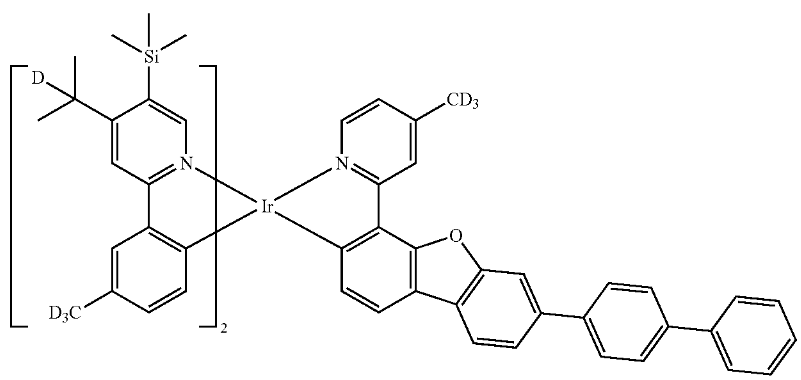
2563
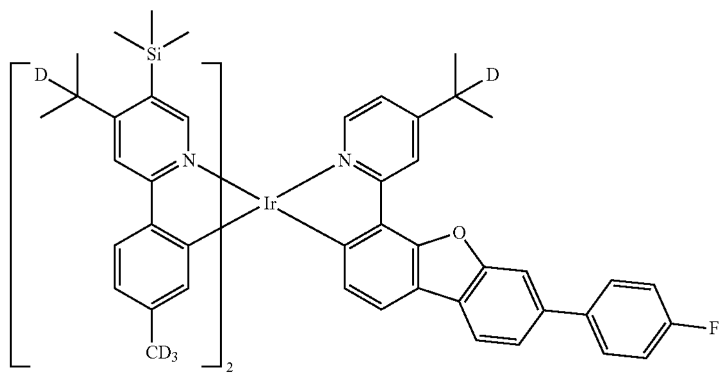
2564
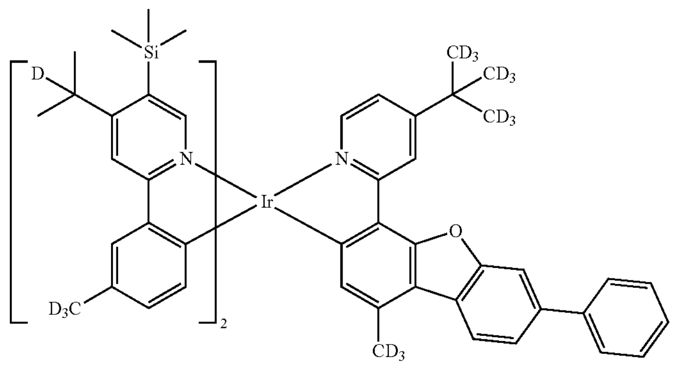

-continued
2565
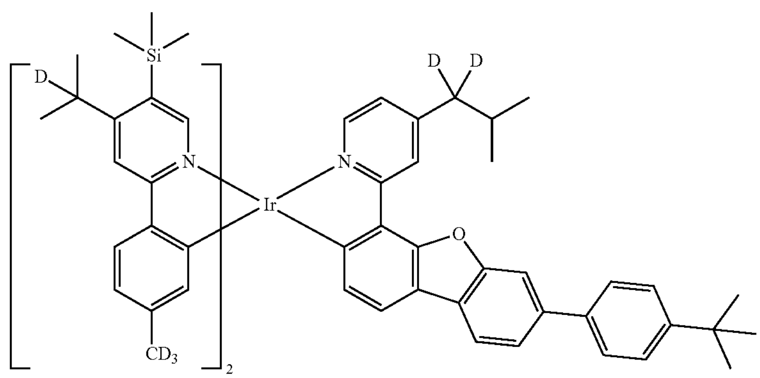
2566
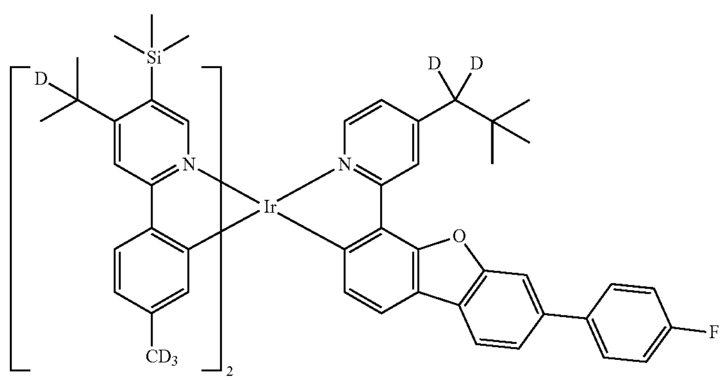
2567
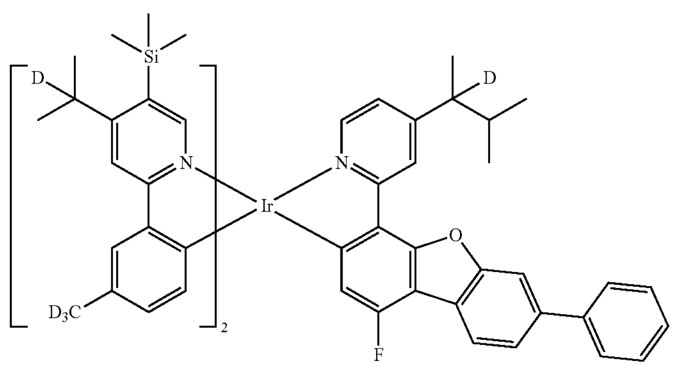
2568
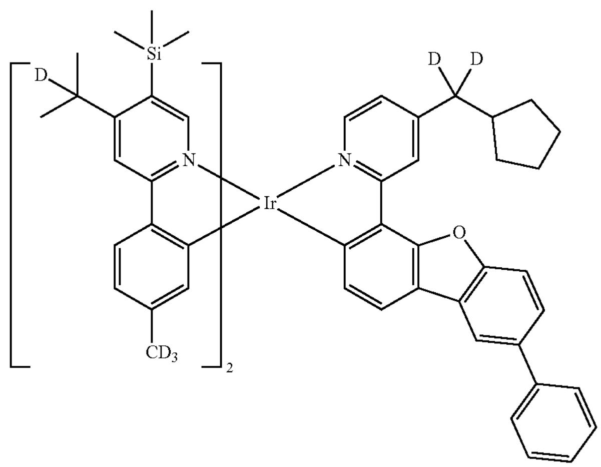

-continued
2569
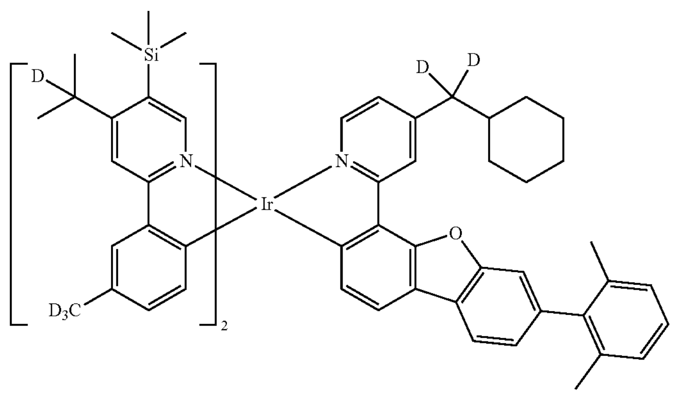
2570
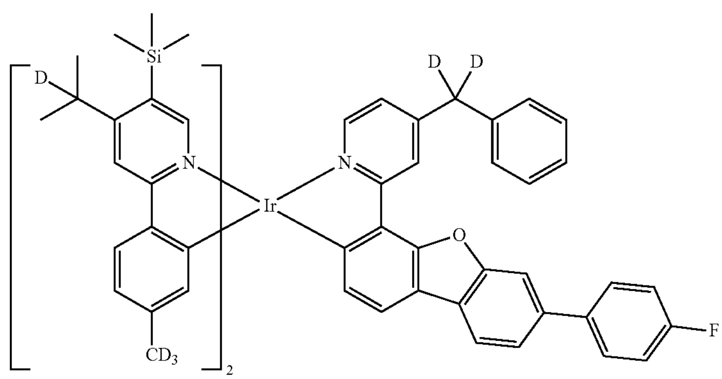
2571
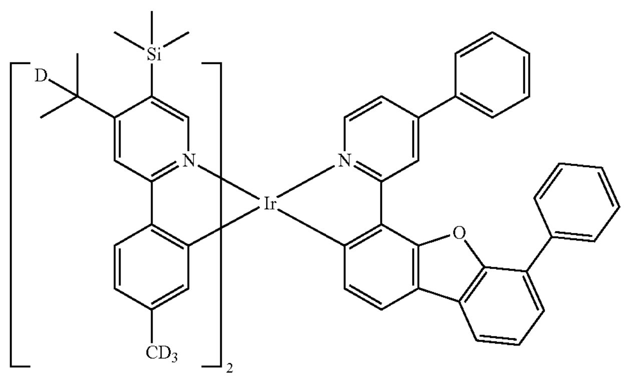
2572
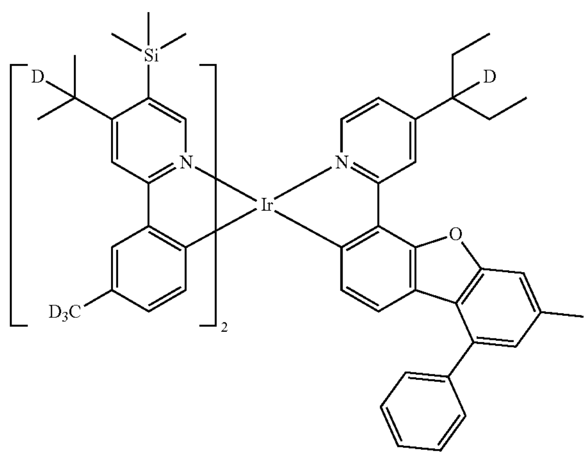

-continued
2573
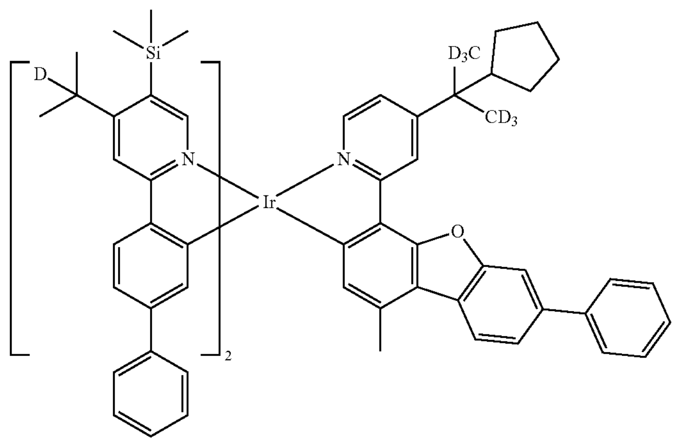
2574
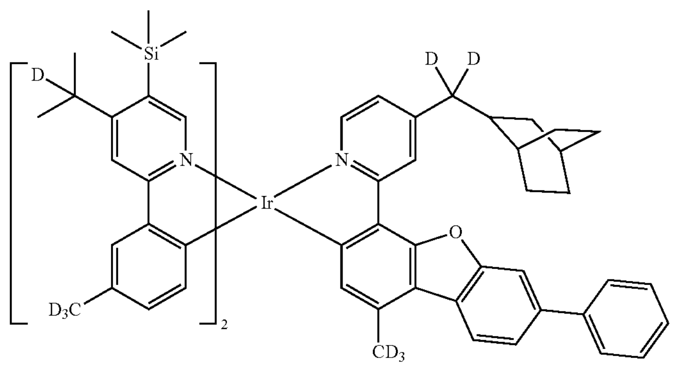
2575
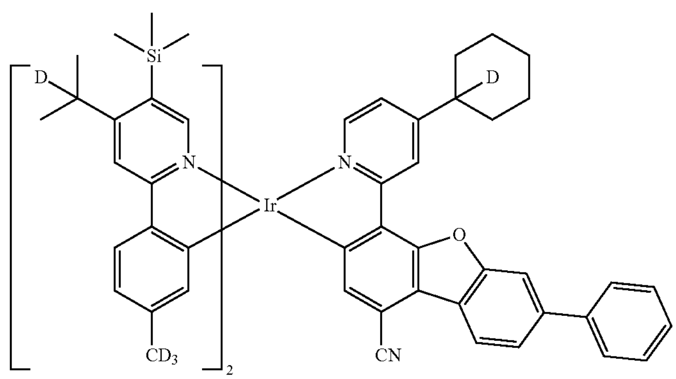
2576
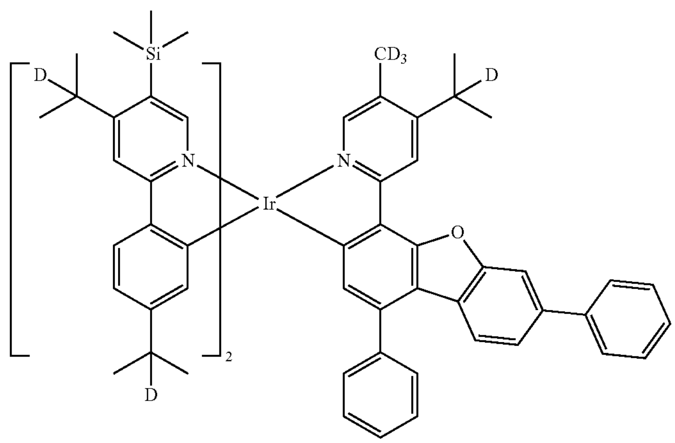

-continued
2577
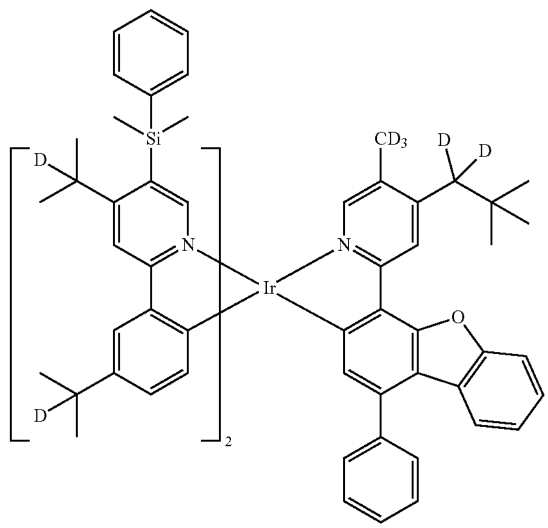
2578
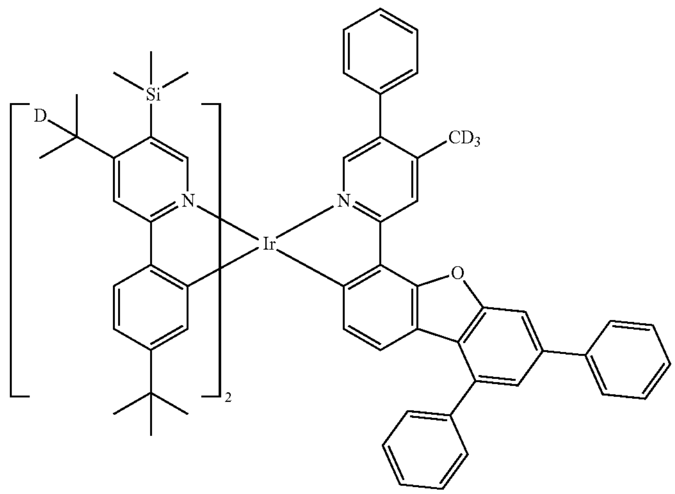
2579
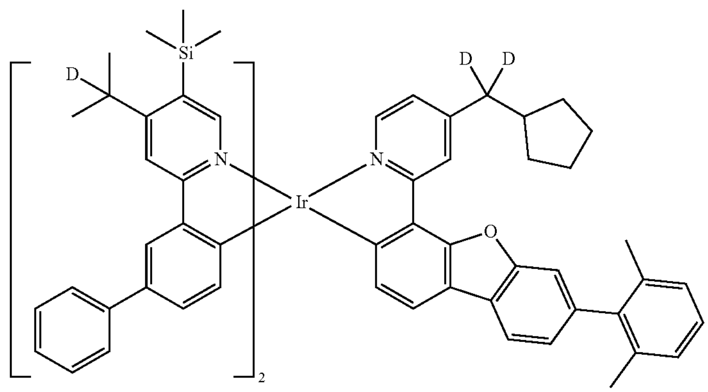

-continued
2580
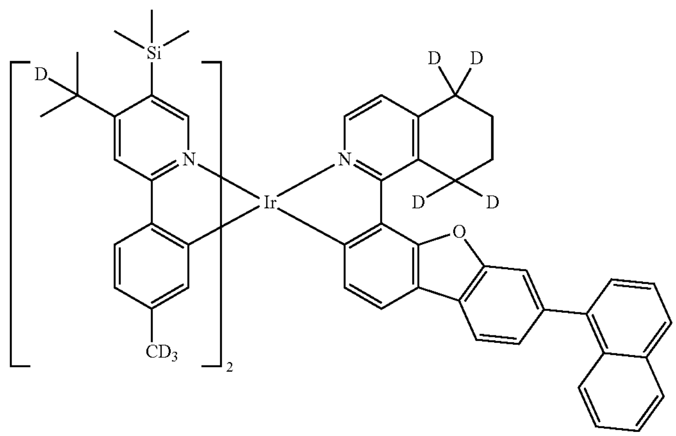
2581
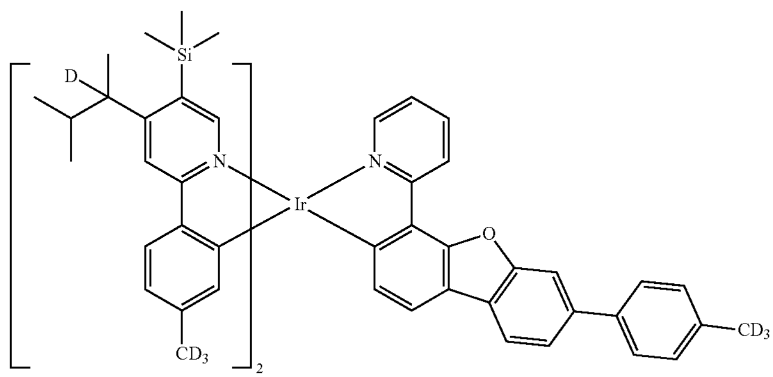
2582
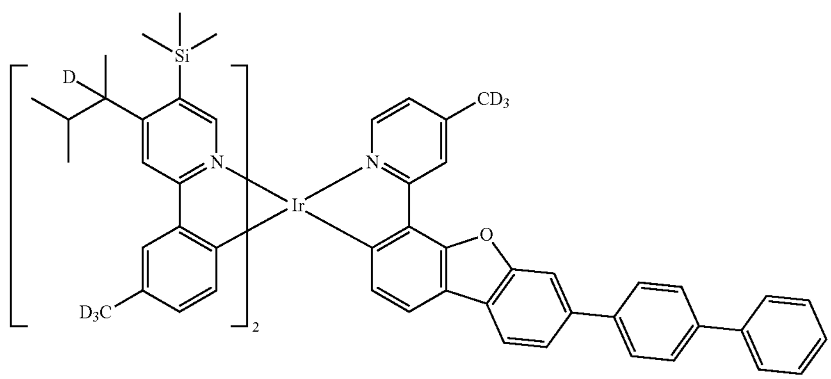
2583
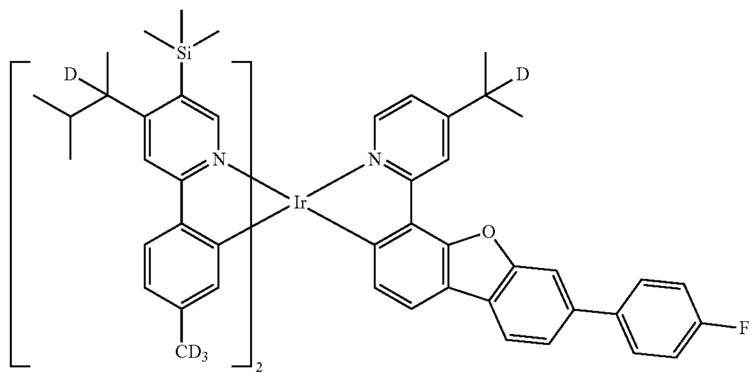

-continued
2584
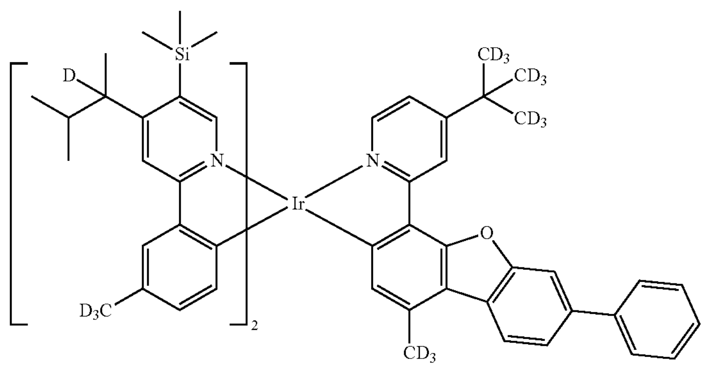
2585
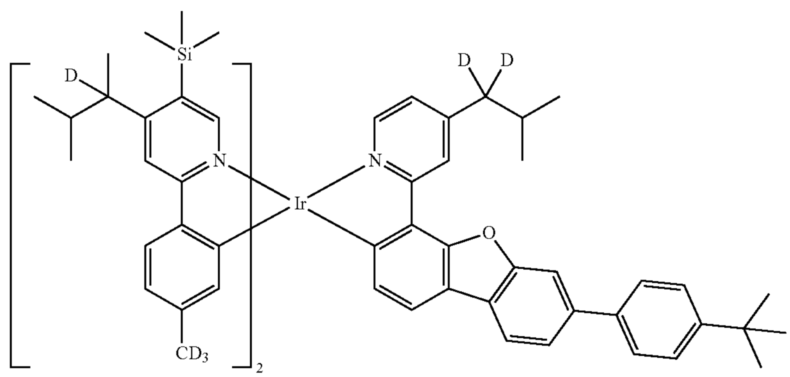
2586
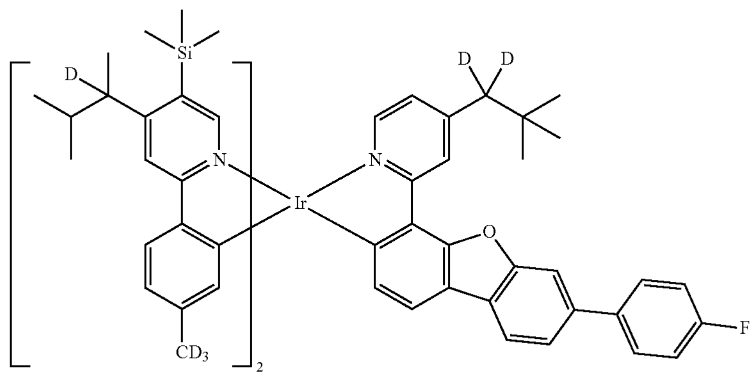
2587
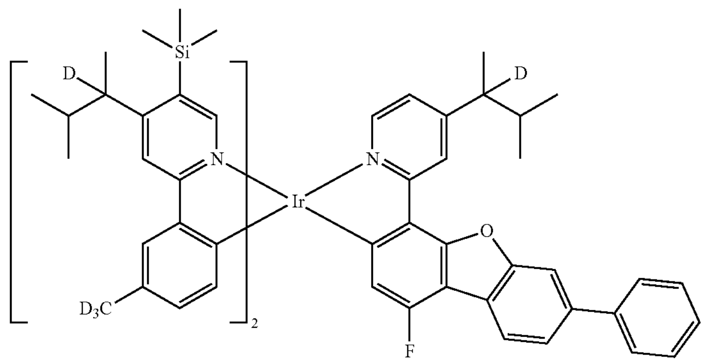

-continued
2588
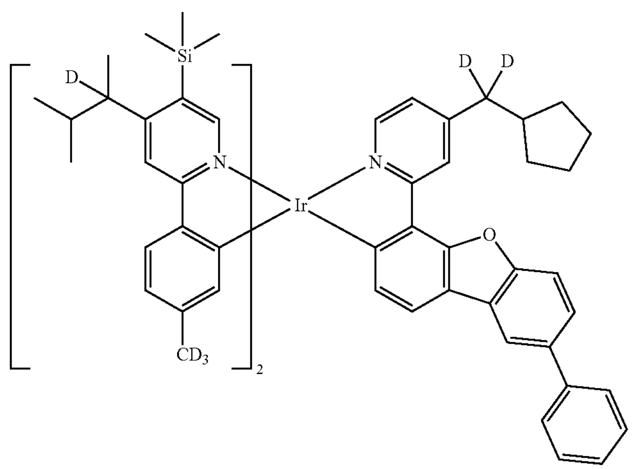
2589
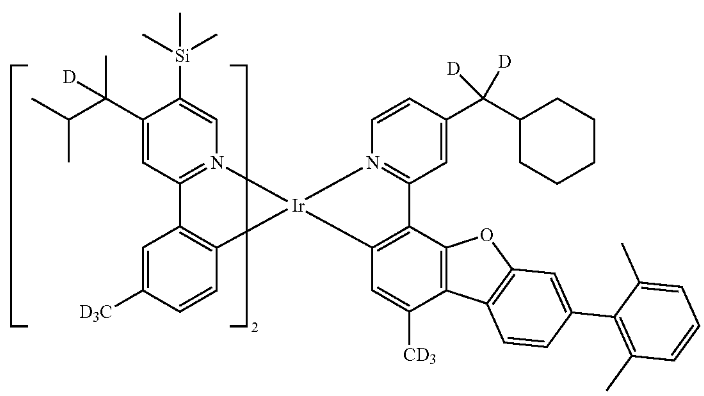
2590
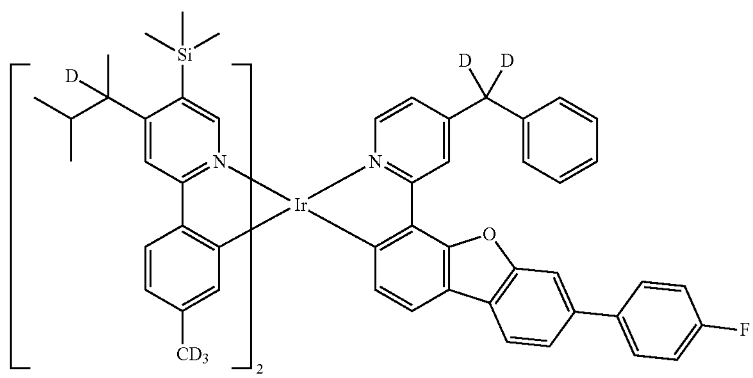
2591
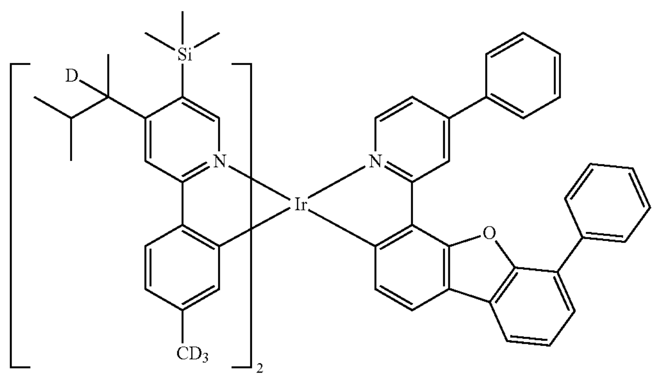

-continued
2592
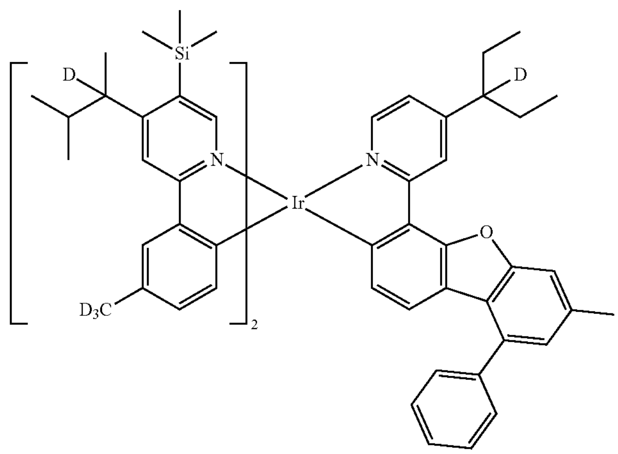
2593
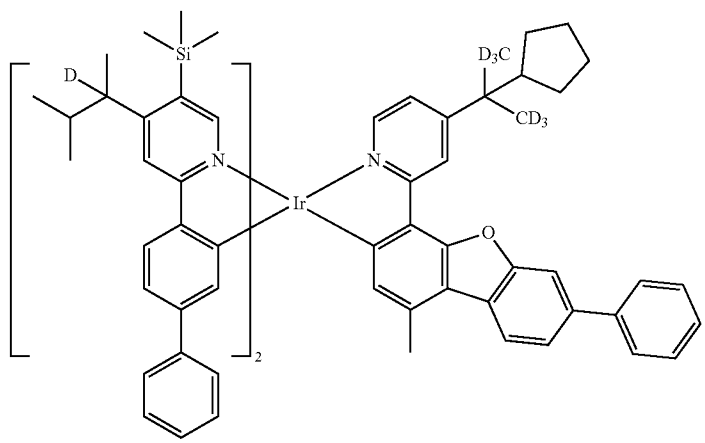
2594
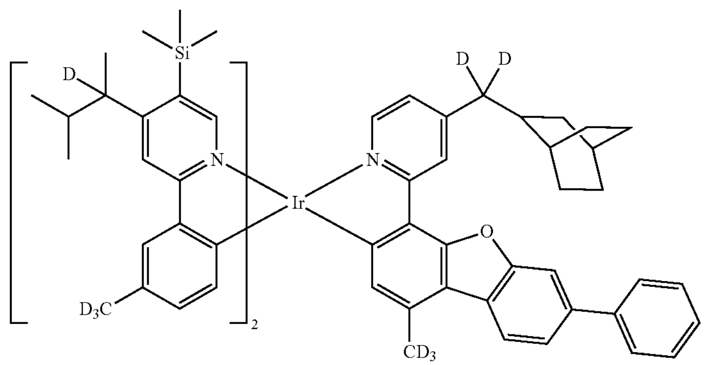
2595
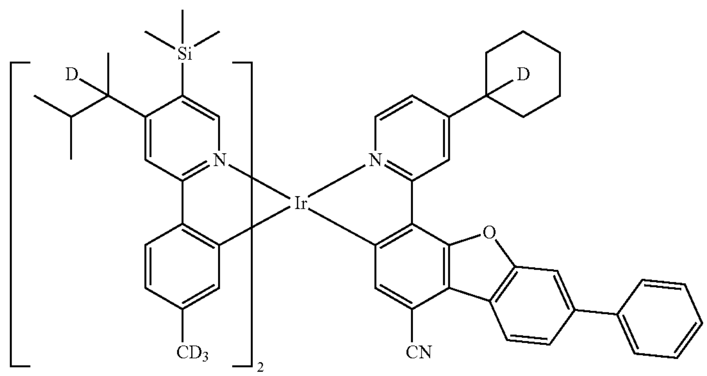

-continued
2596
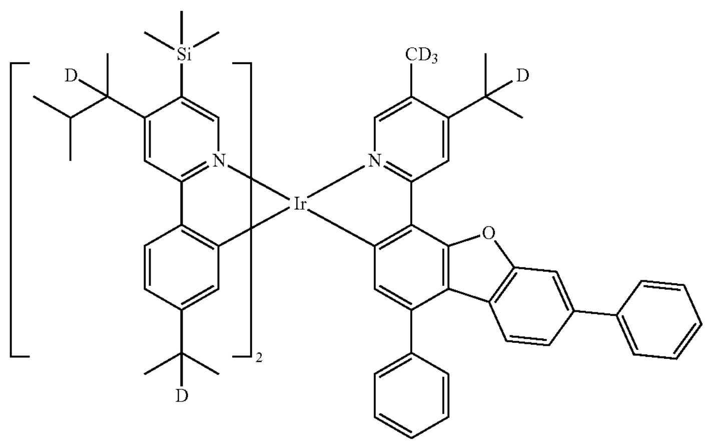
2597
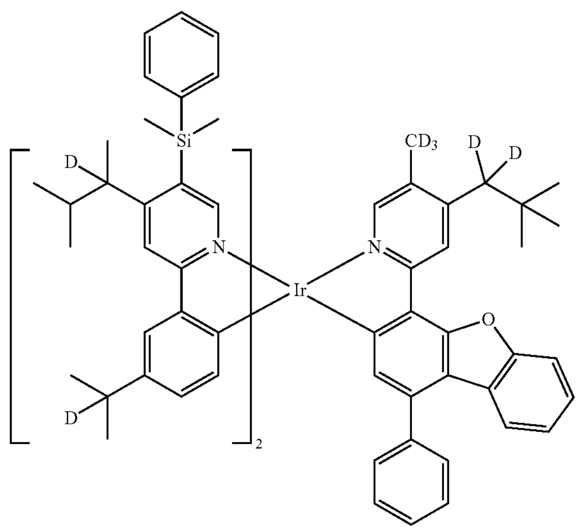
2598
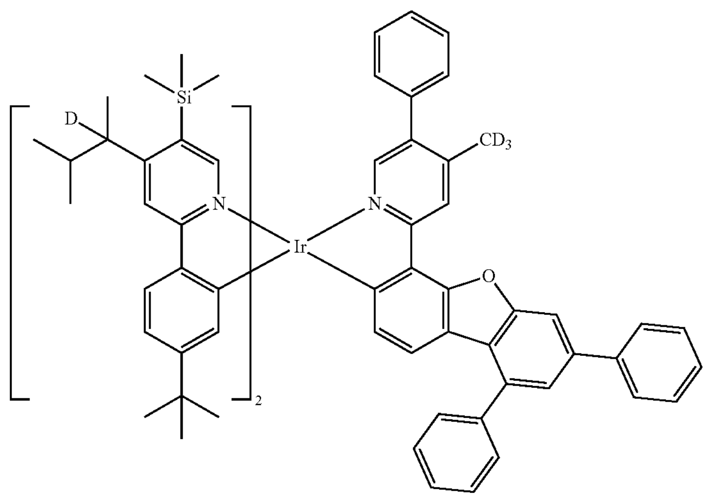

-continued
2599
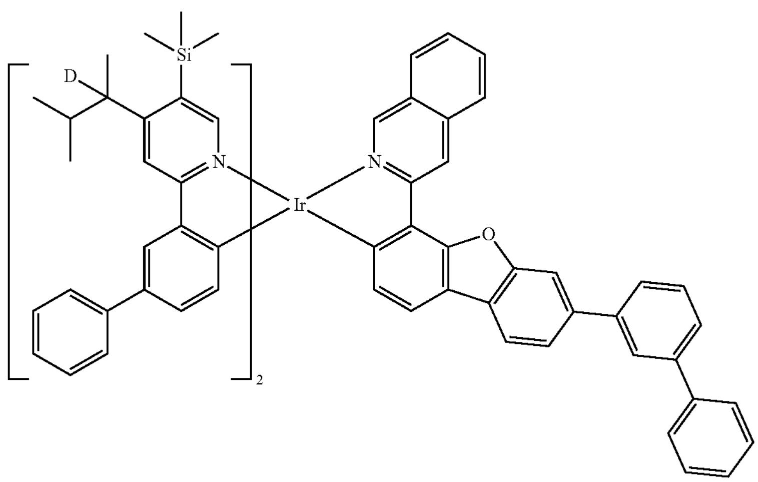
2600
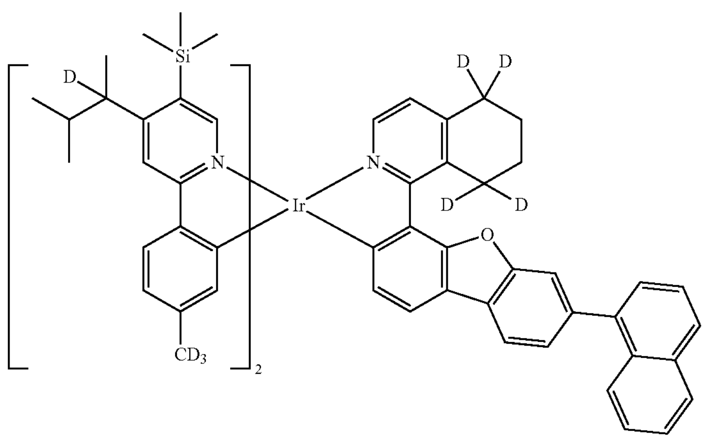
2601
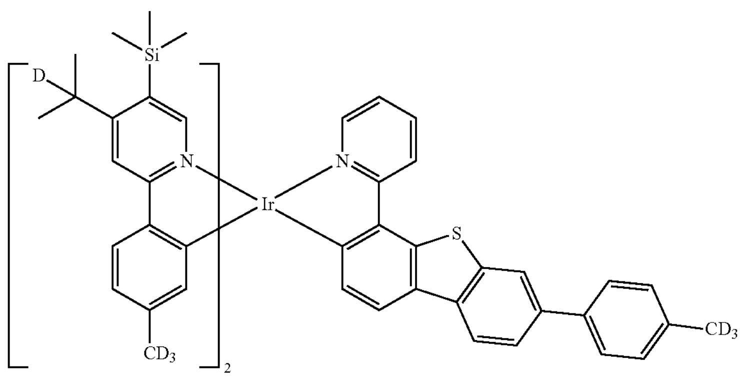
2602
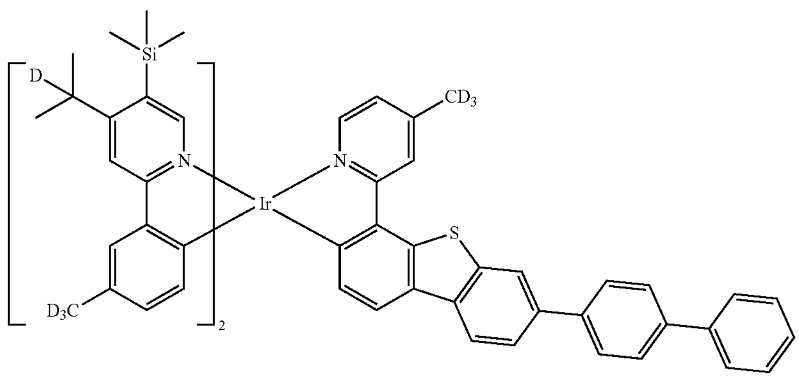

-continued
2603
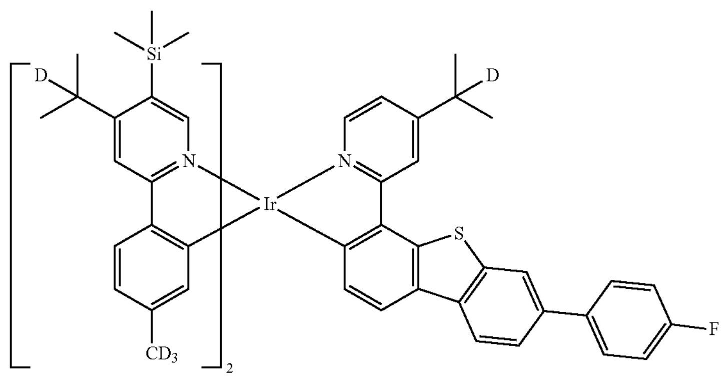
2604
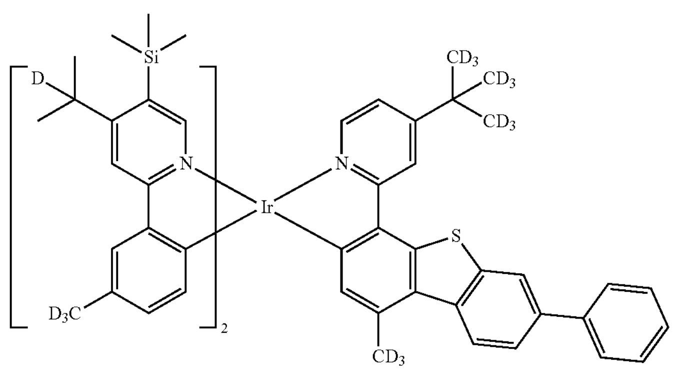
2605
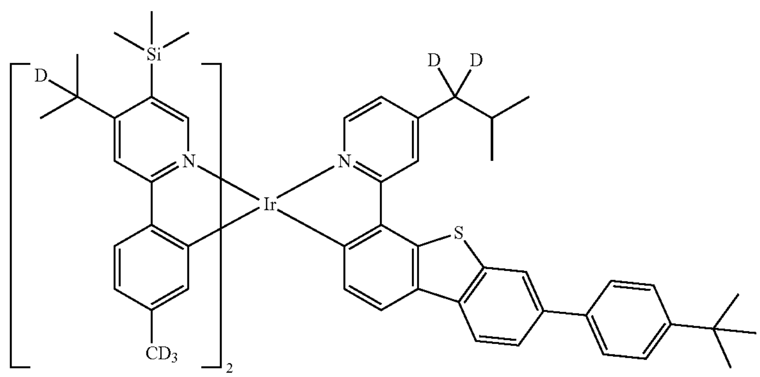
2606
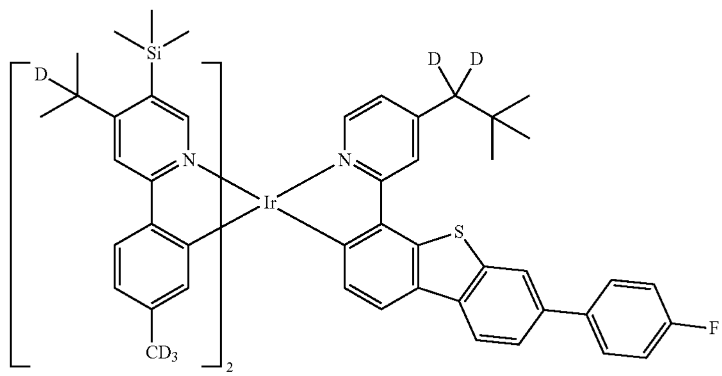

-continued
2607
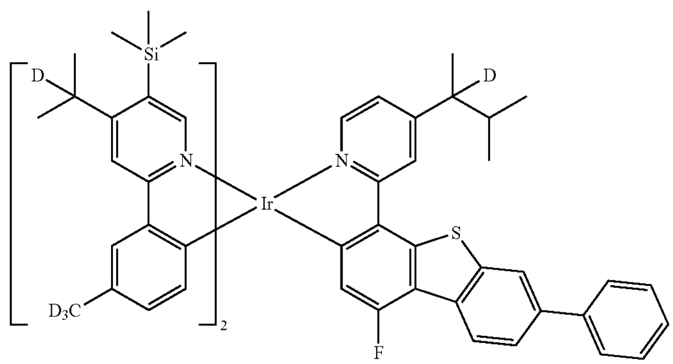
2608
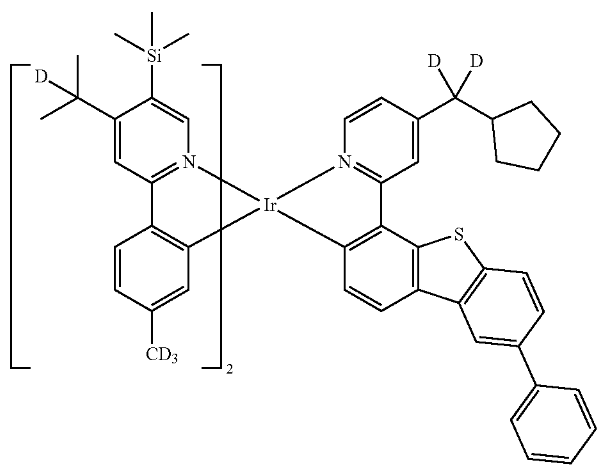
2609
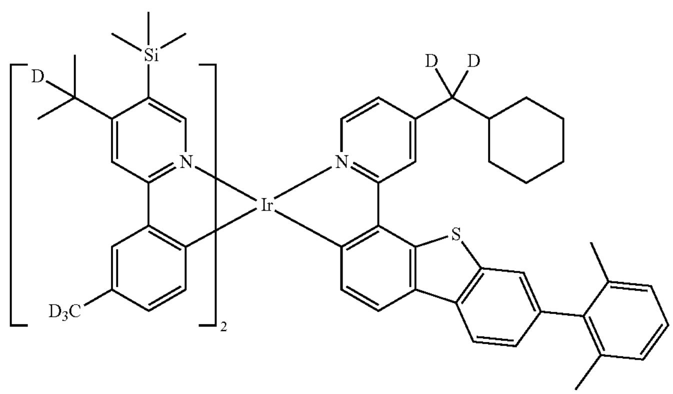
2610
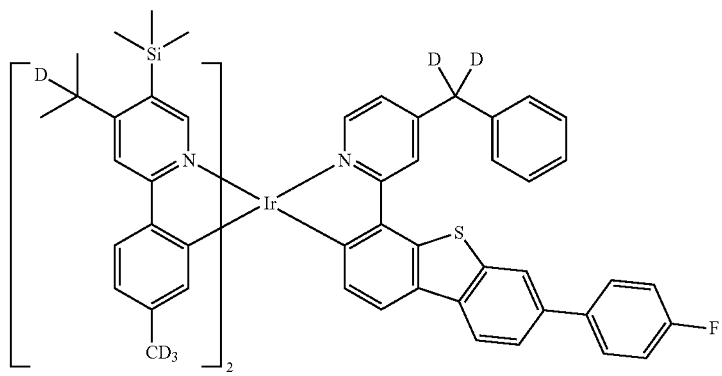

-continued
2611
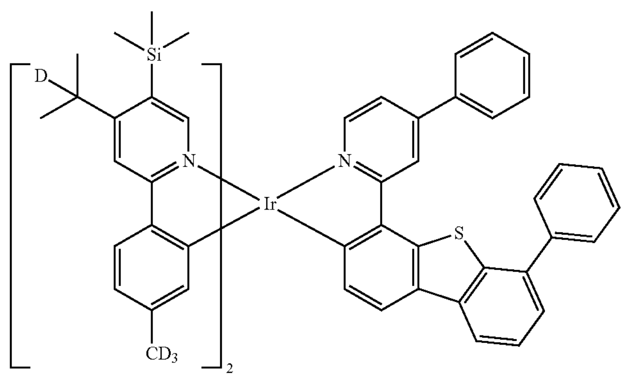
2612
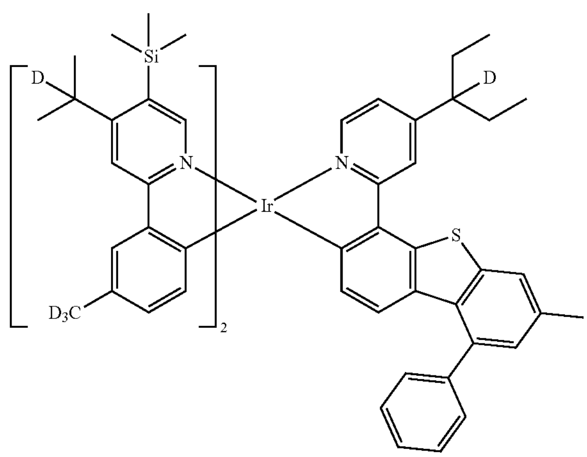
2613
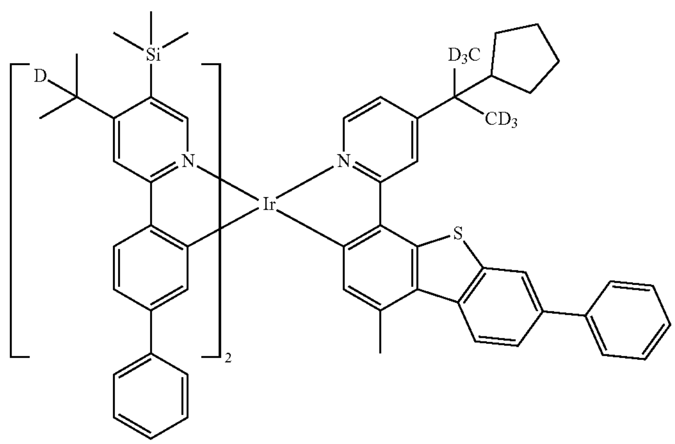
2614
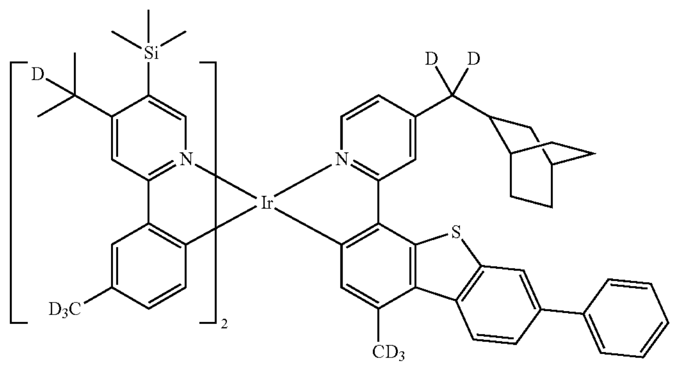

-continued
2615
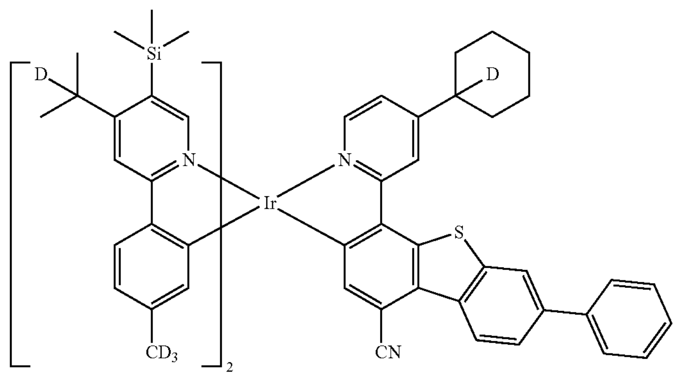
2616
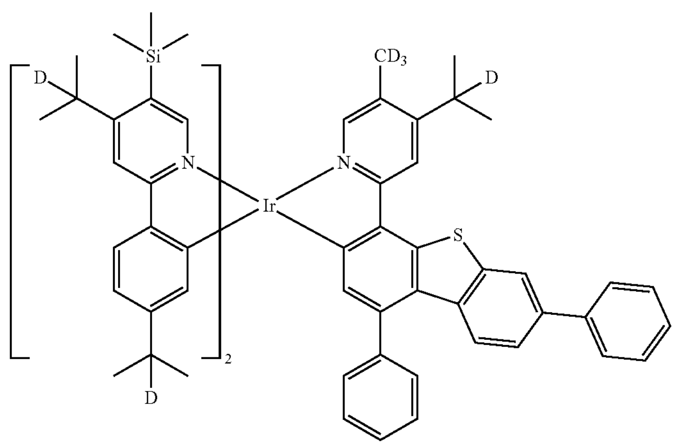
2617
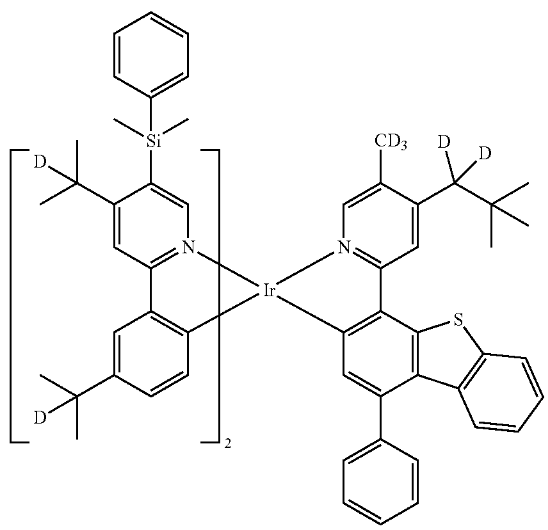

-continued
2618
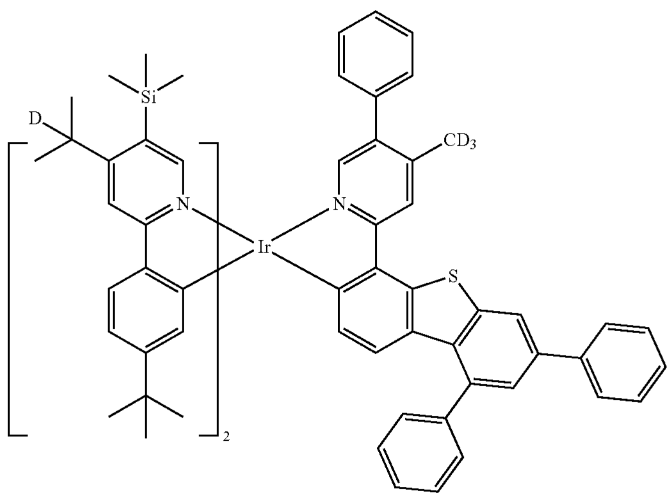
2619
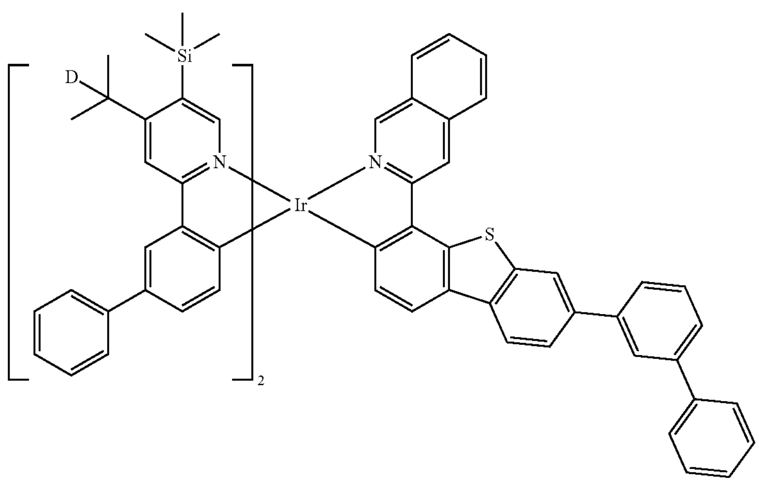
2620
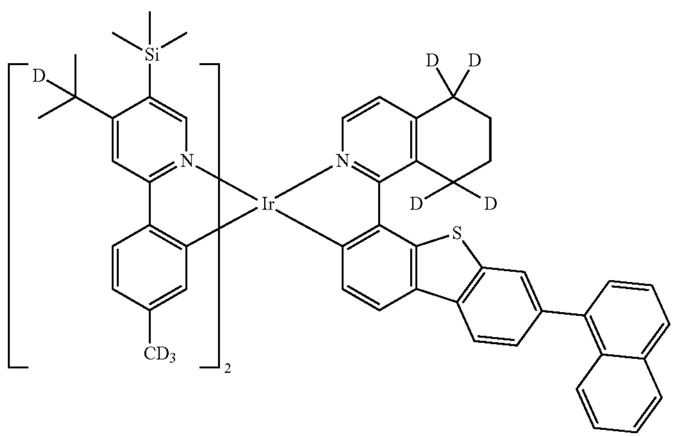

-continued
2621
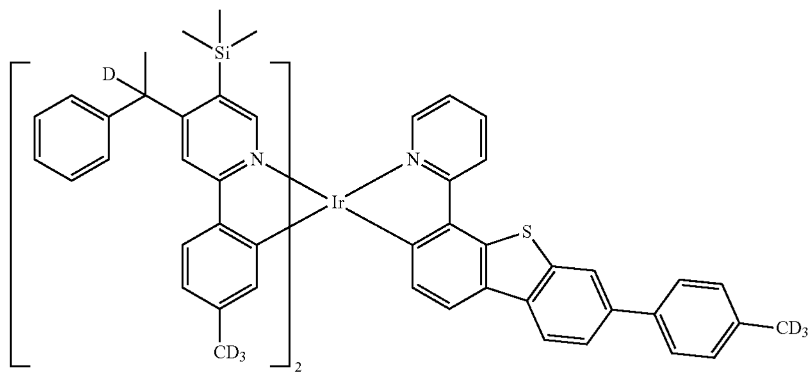
2622
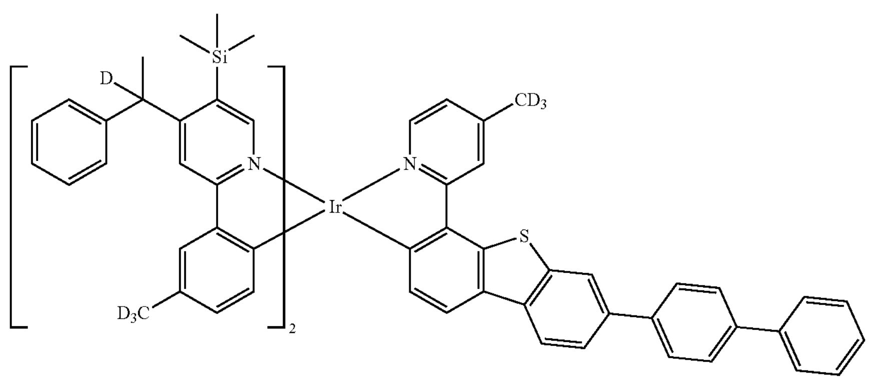
2623
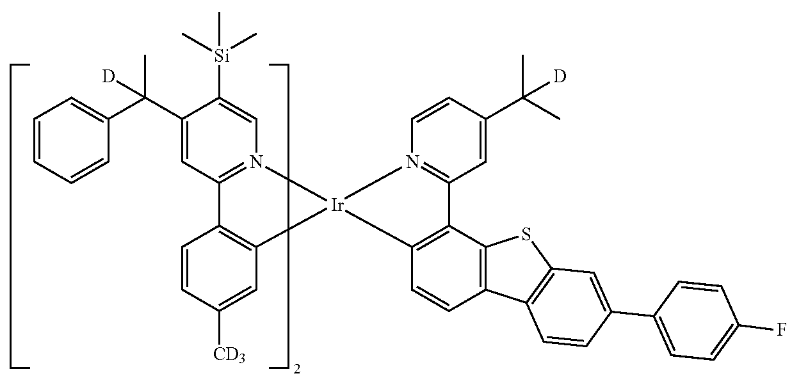
2624
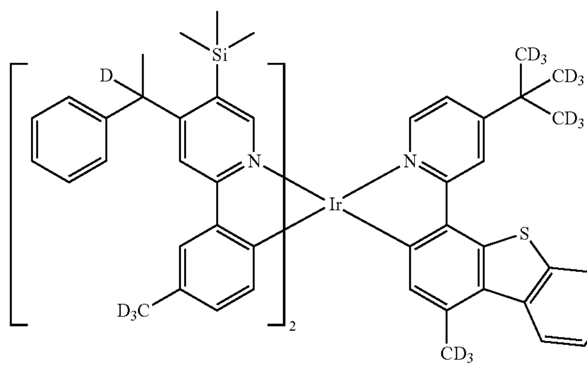

-continued
2625
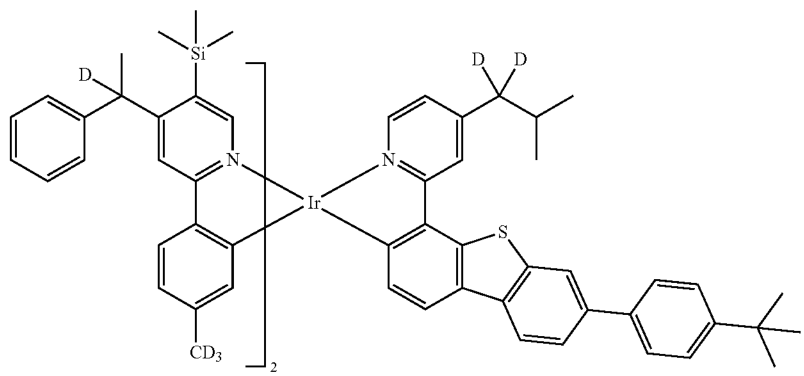
2626
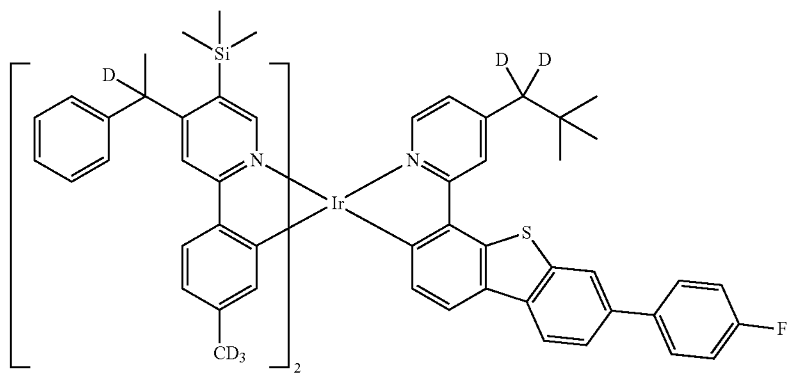
2627
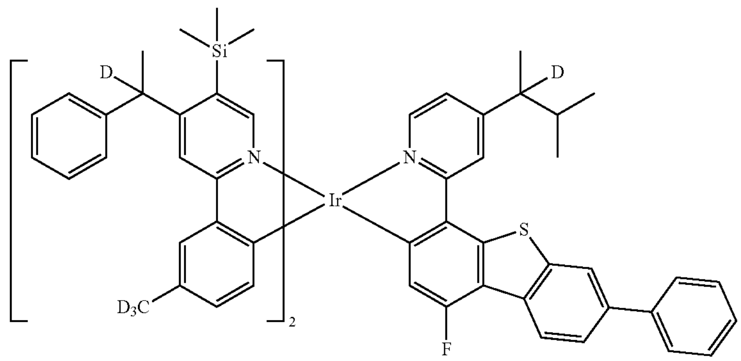
2628
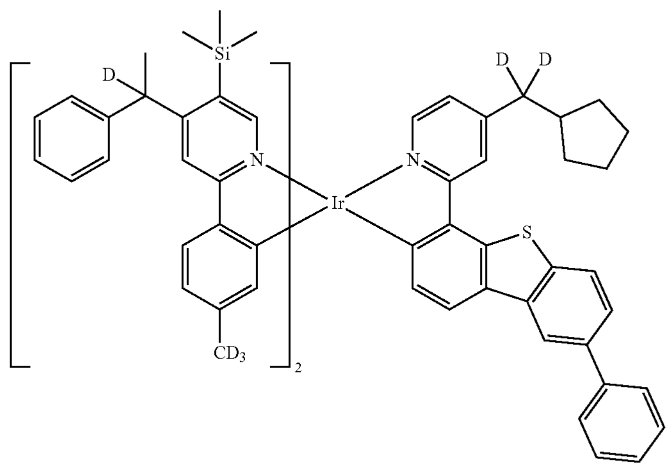

-continued
2629
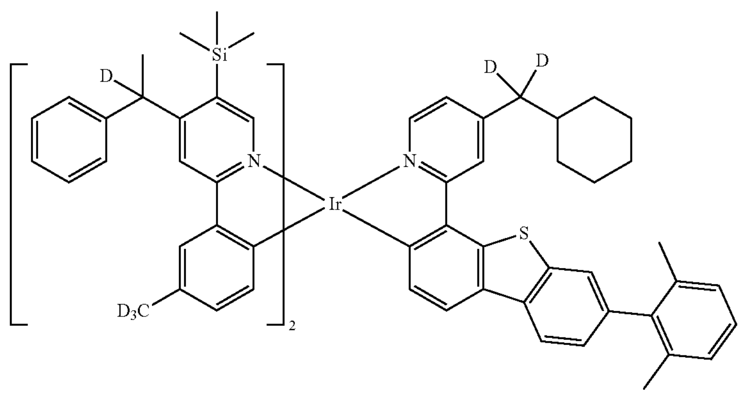
2630
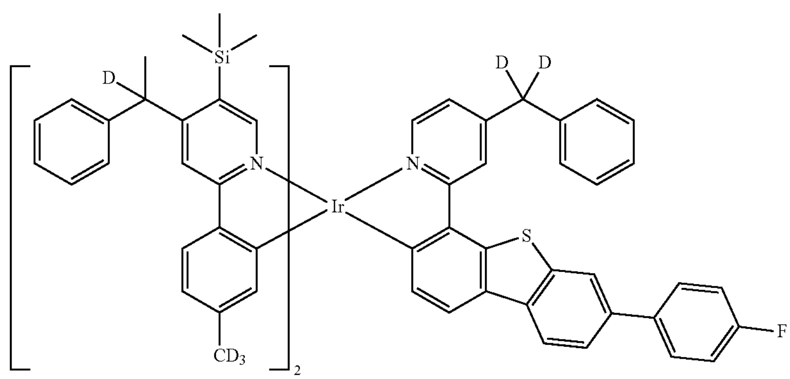
2631
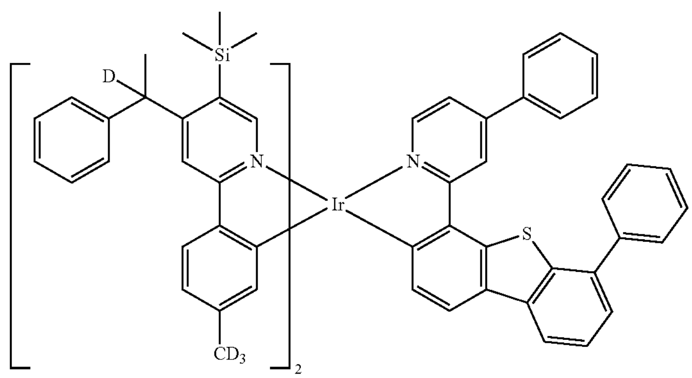
2632
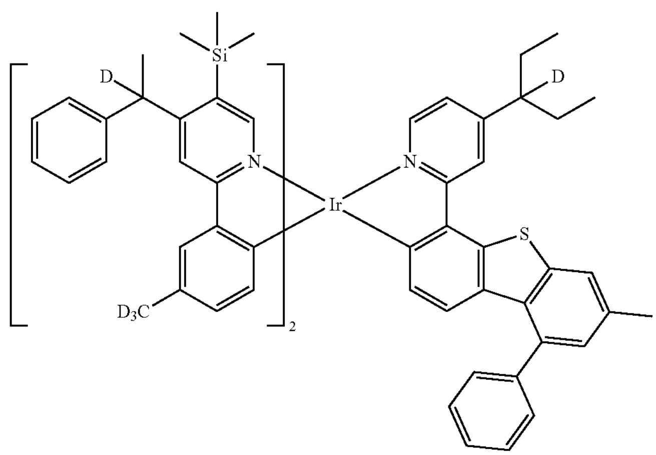

-continued
2633
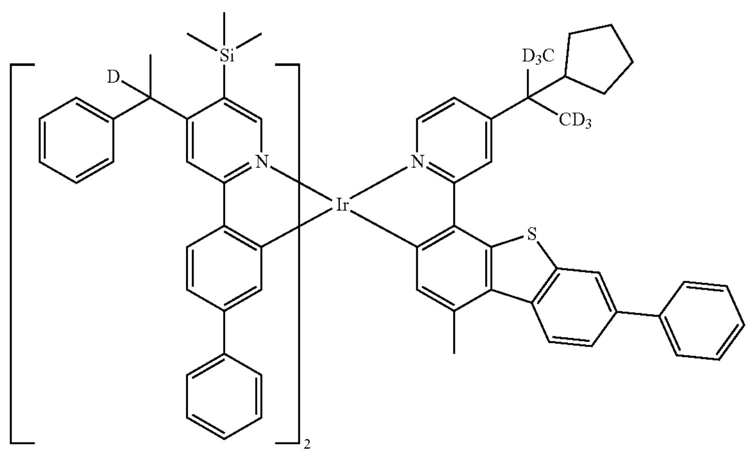
2634
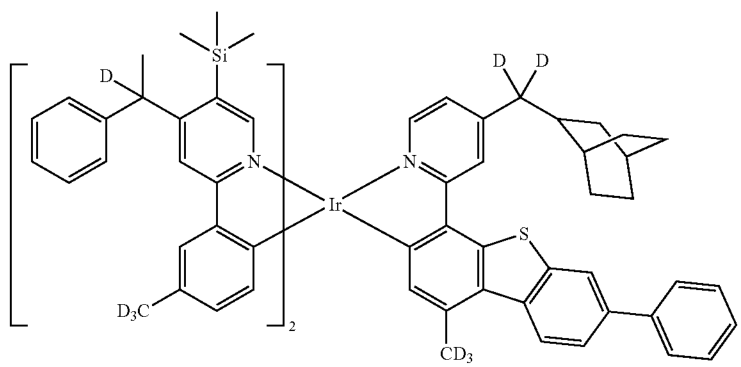
2635
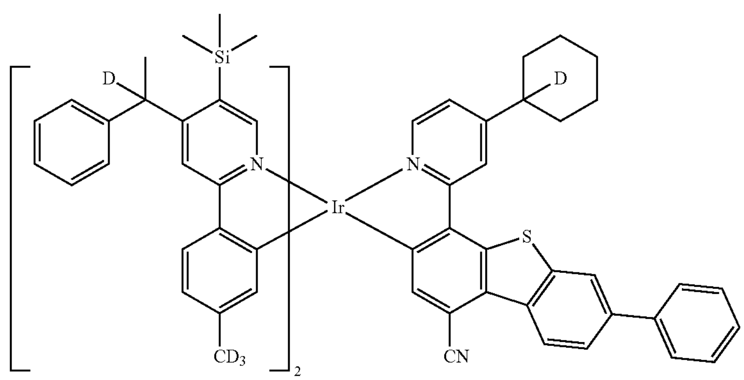
2636
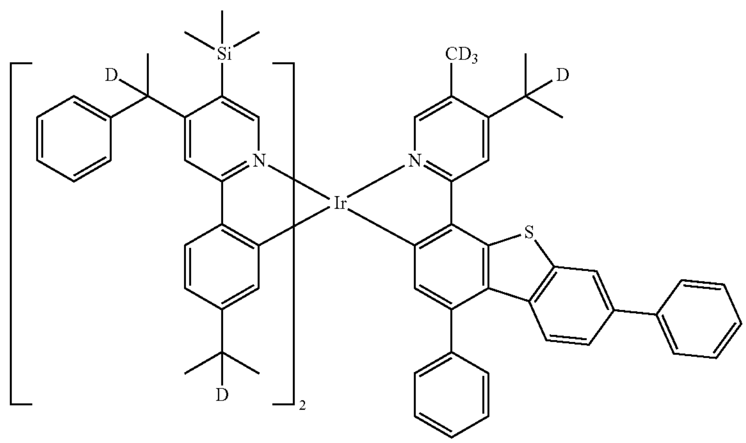

-continued
2637
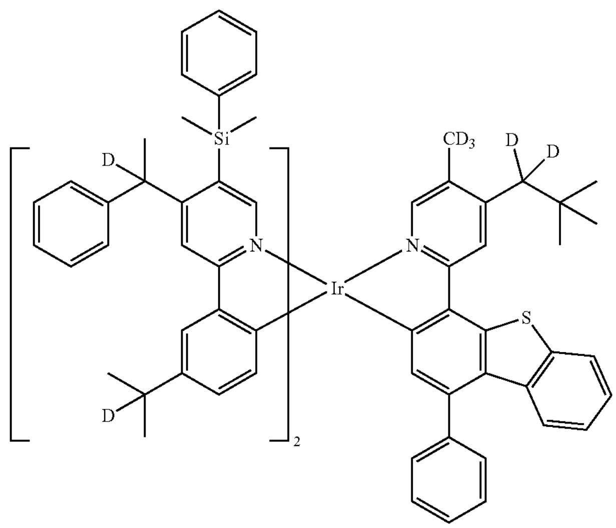
2638
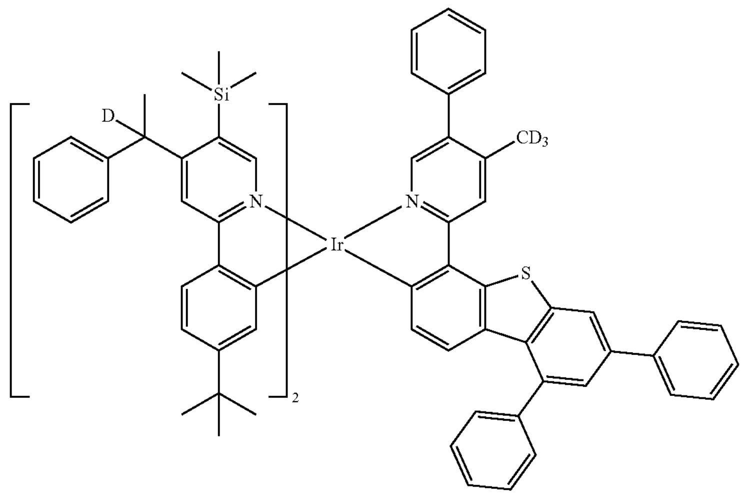
2639
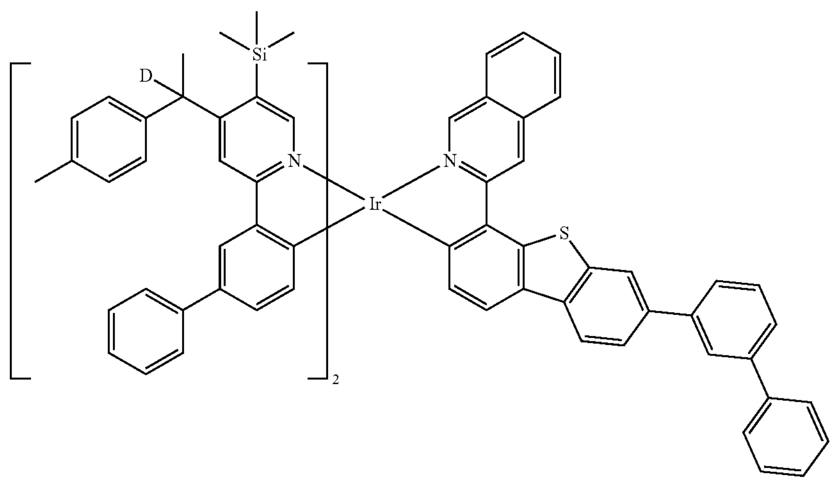

-continued
2640
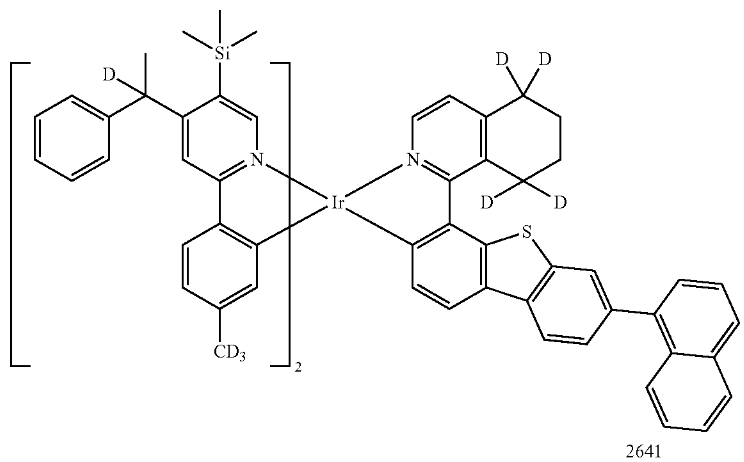
2641
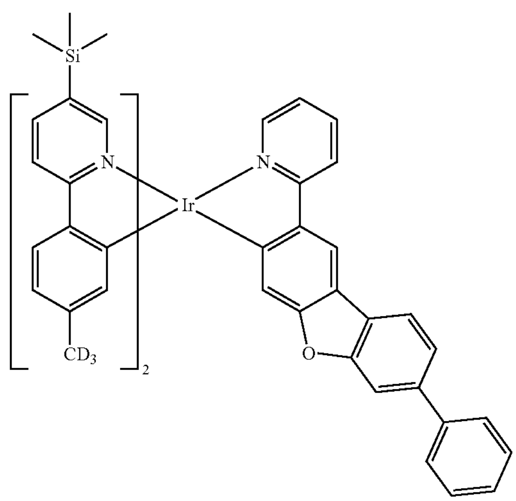
2642
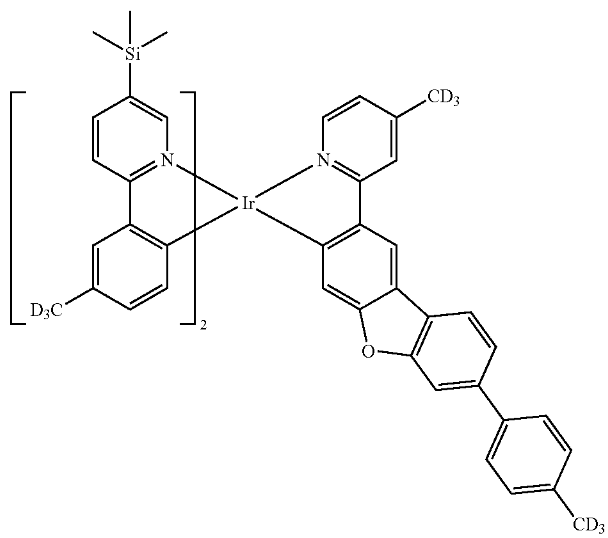

-continued
2643
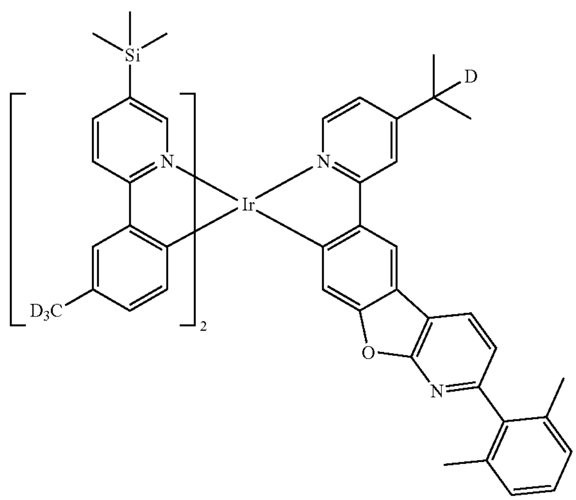
2644
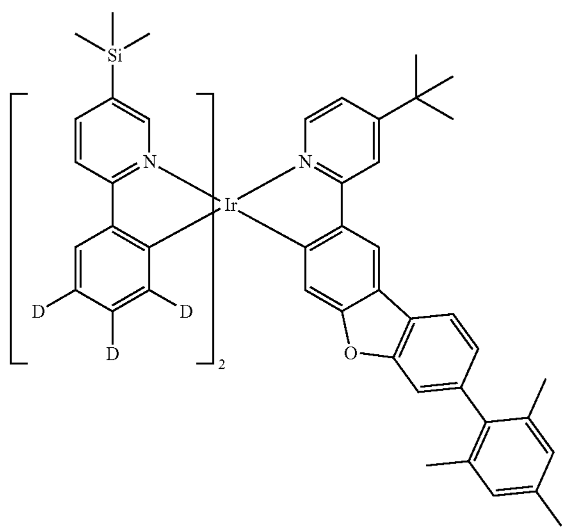
2645
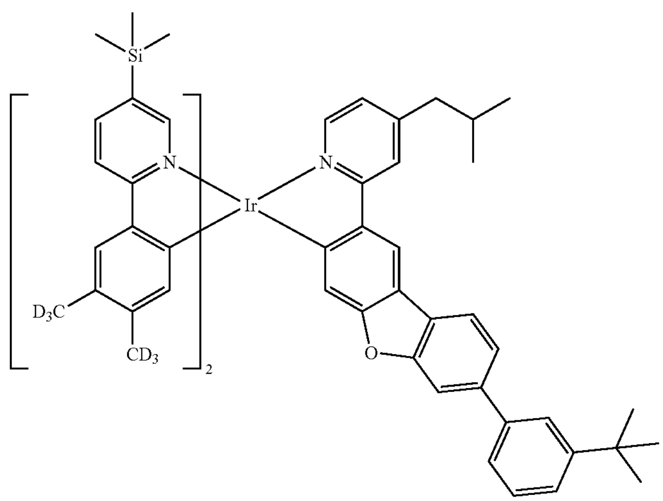

-continued
2646
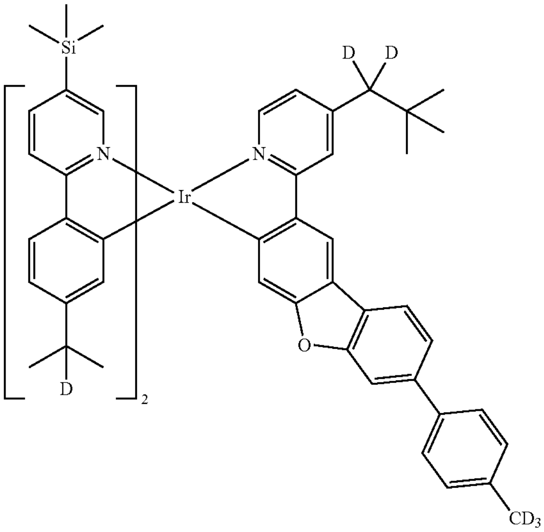
2647
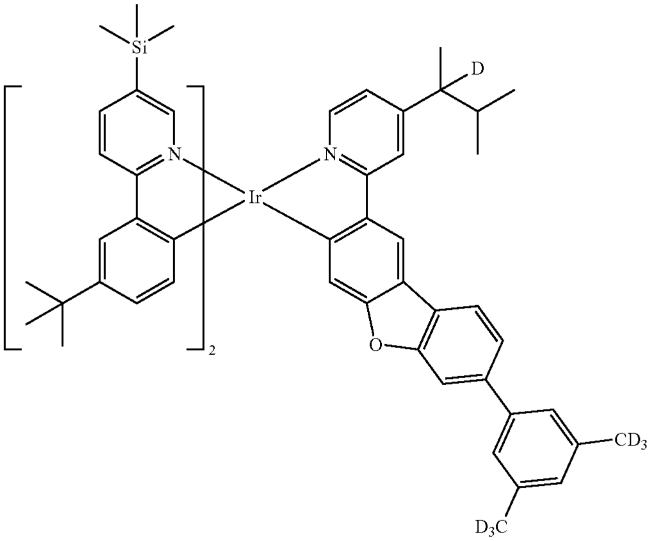
2648
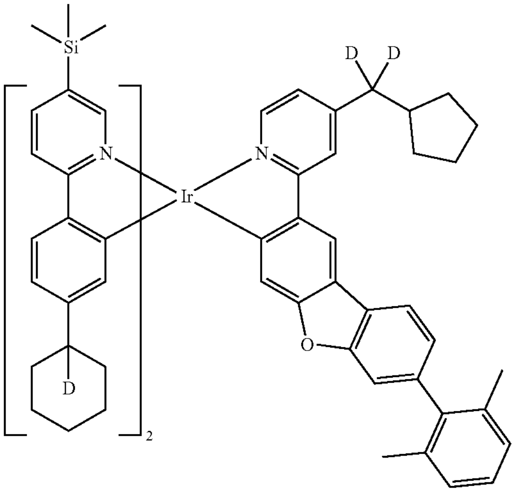

-continued
2649
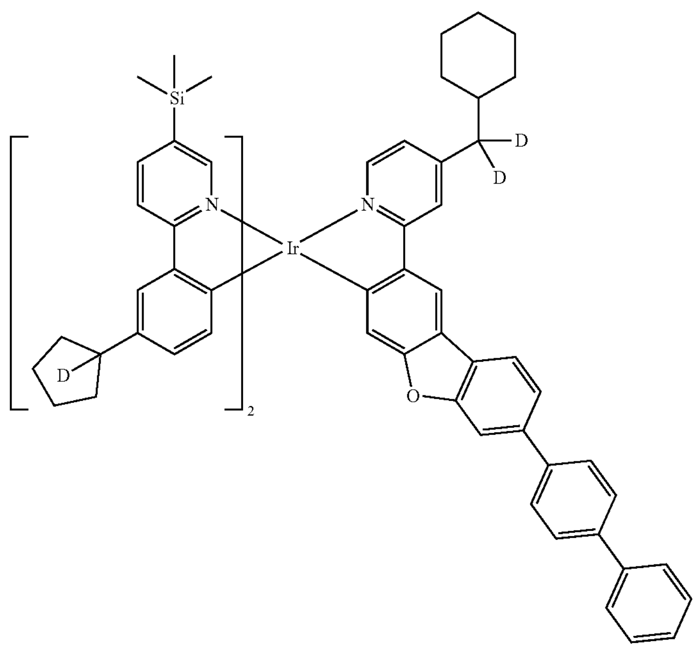
2650
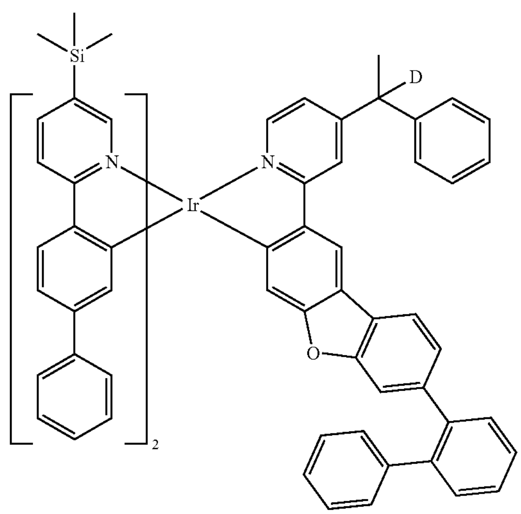
2651
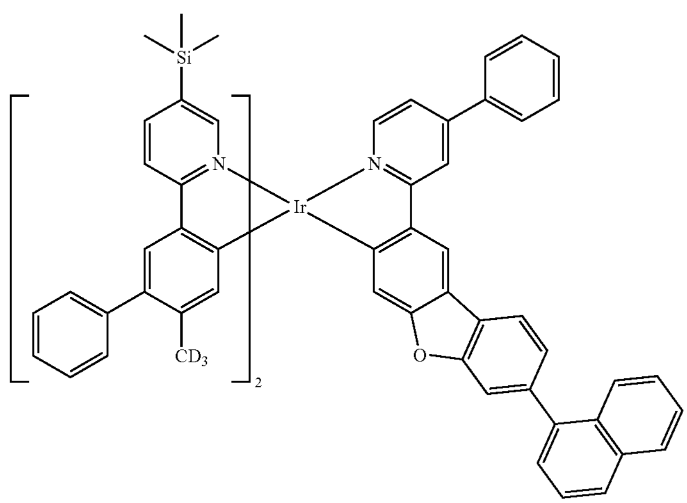

-continued
2652
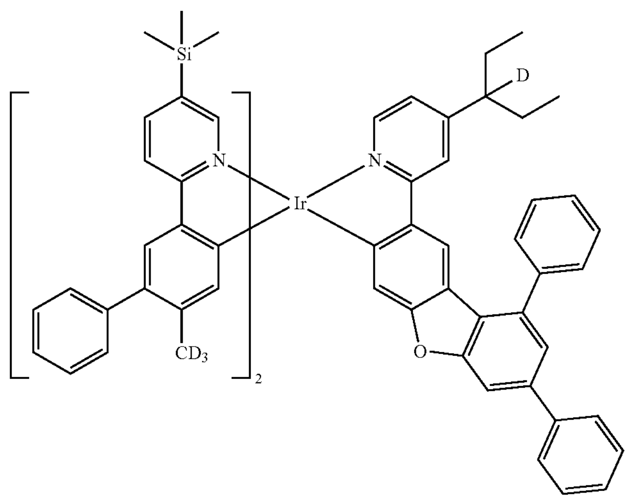
2653
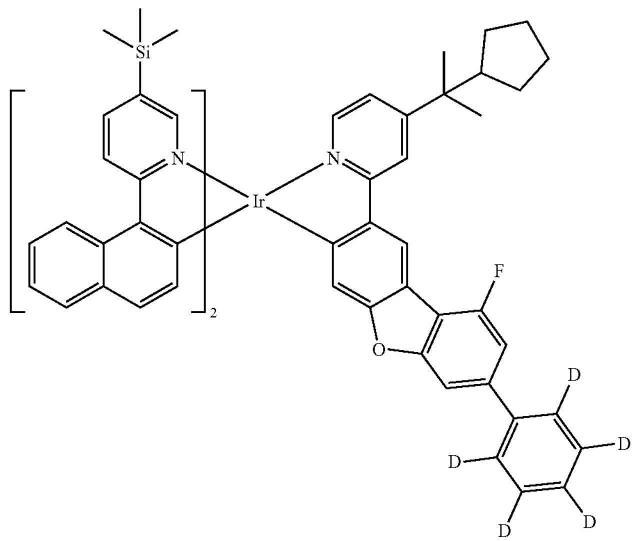
2654
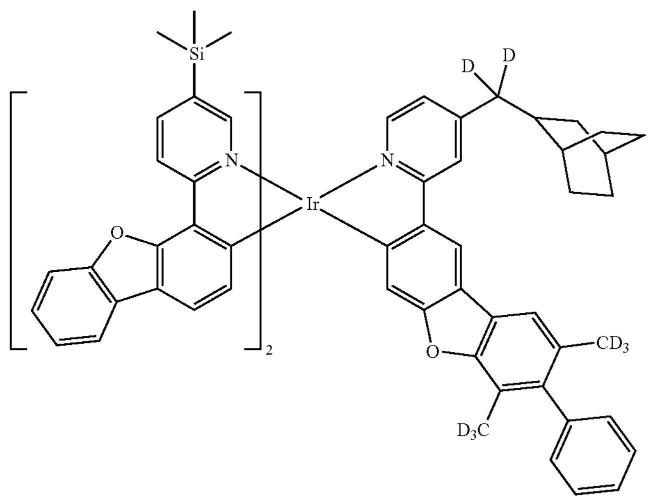

-continued
2655
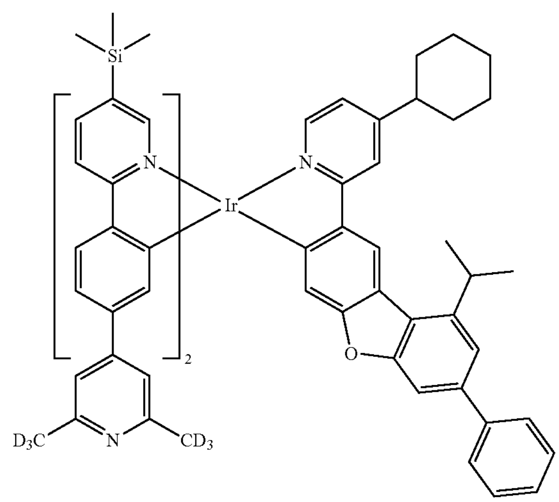
2656
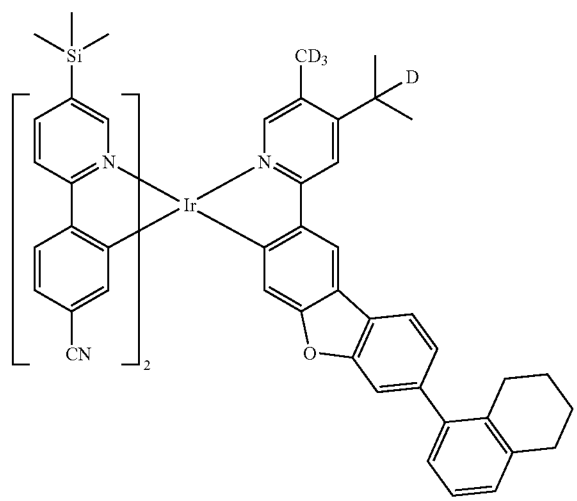
2657
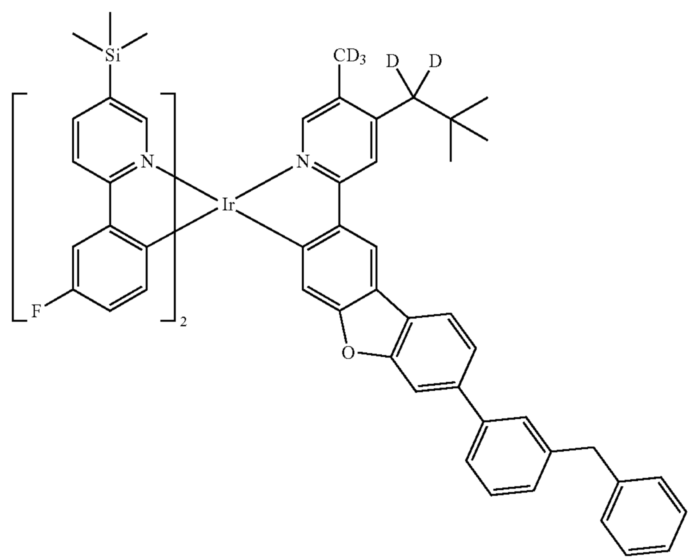

-continued
2658
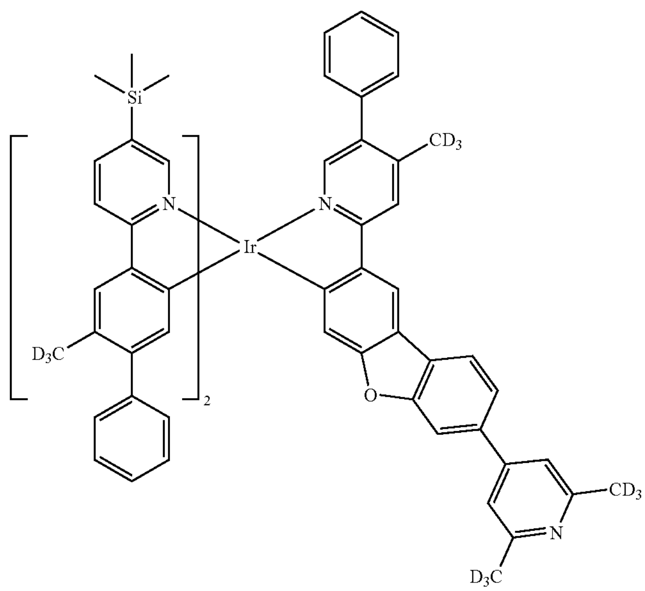
2659
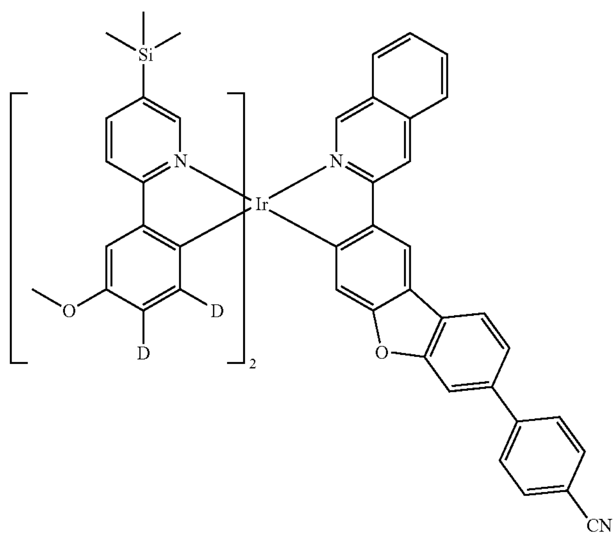
2660
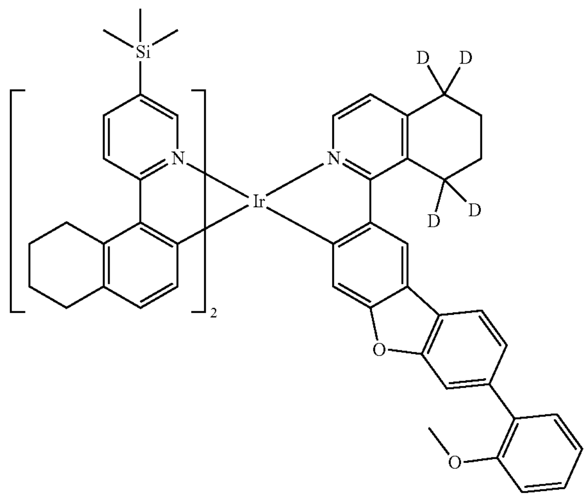

-continued
2661
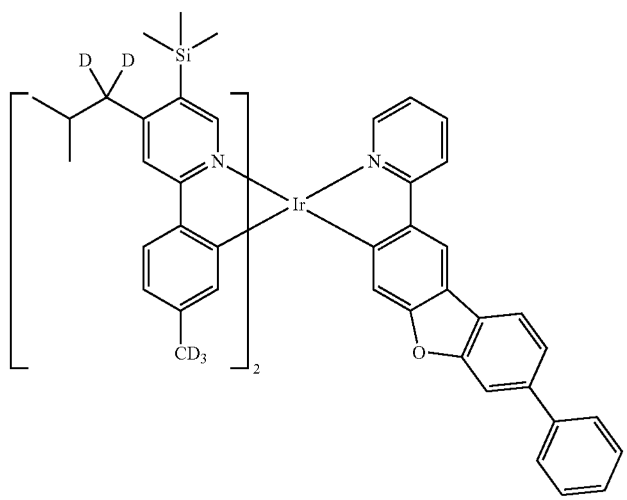
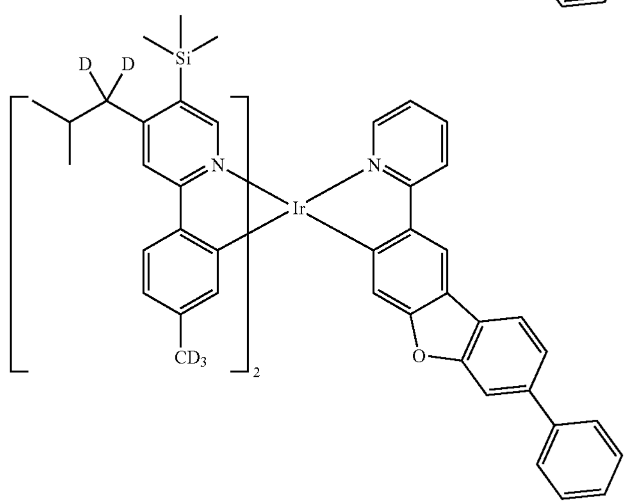
2662
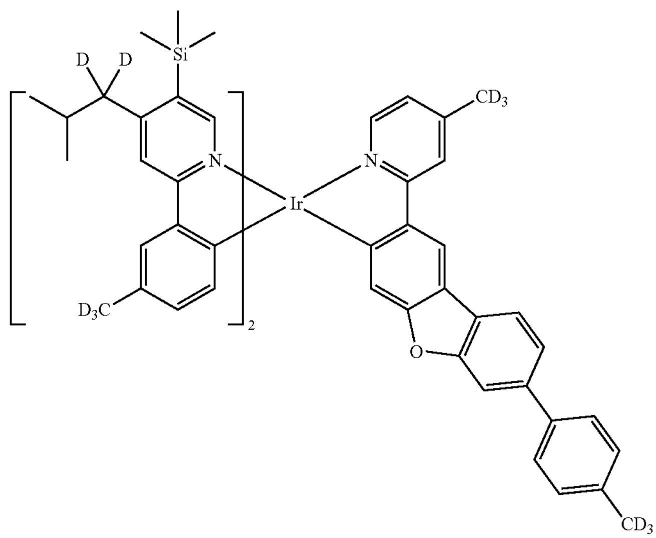

-continued
2663
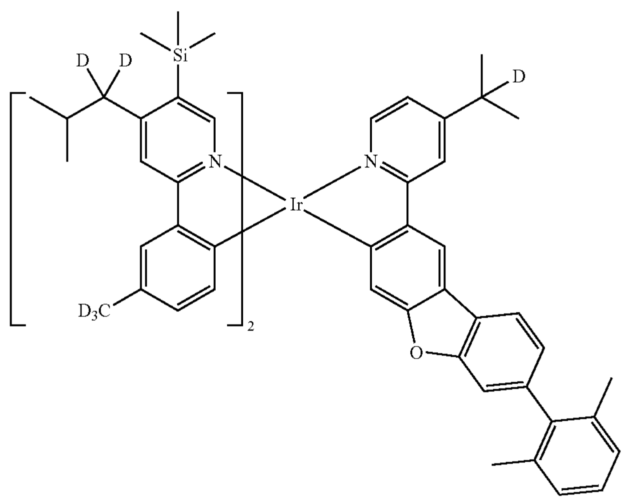
2664
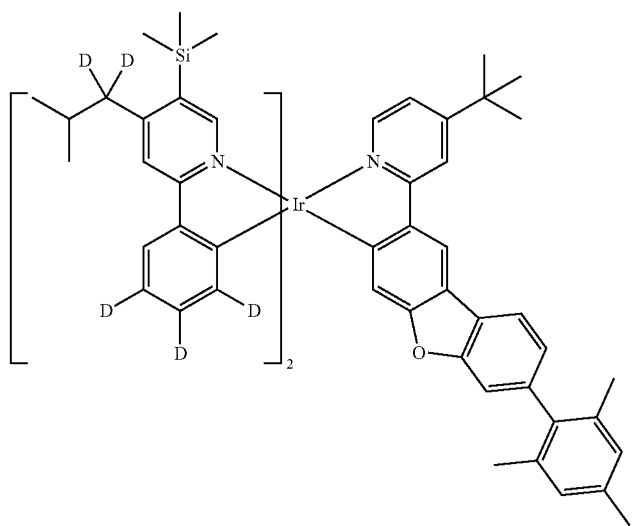
2665
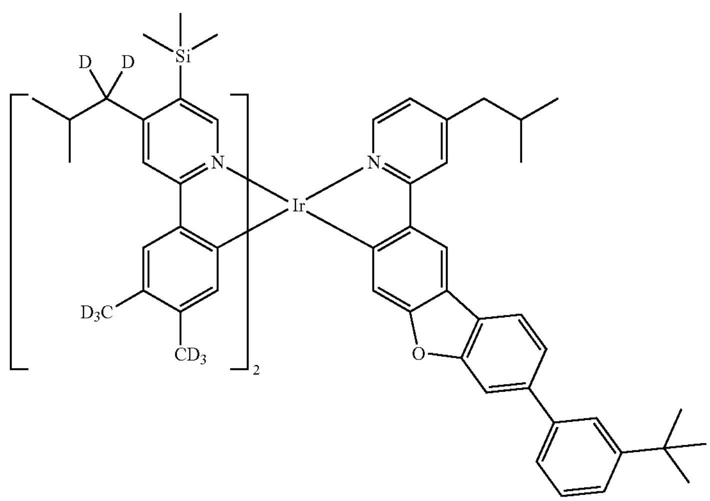

-continued
2666
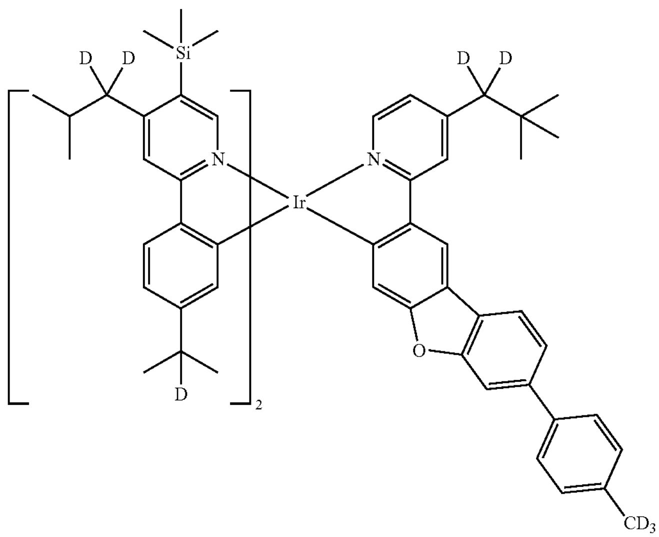
2667
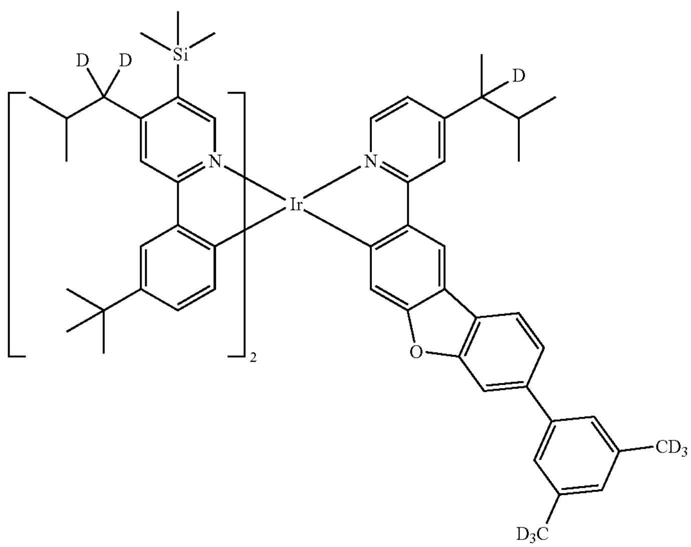
2668
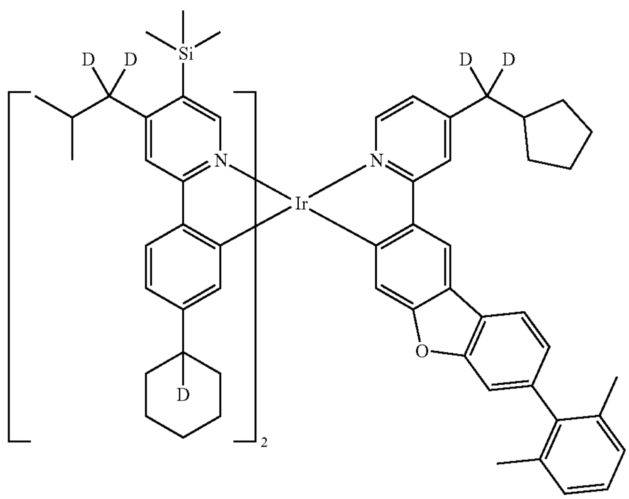

-continued
2669
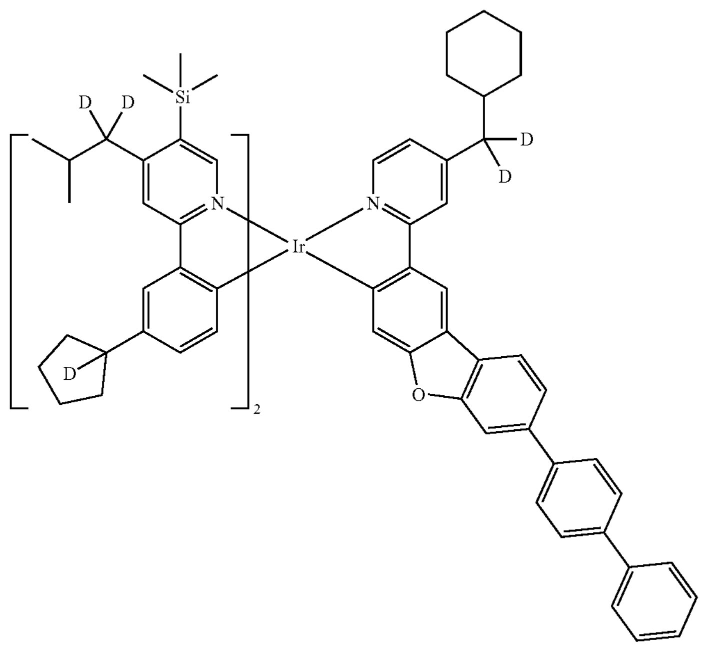
2670
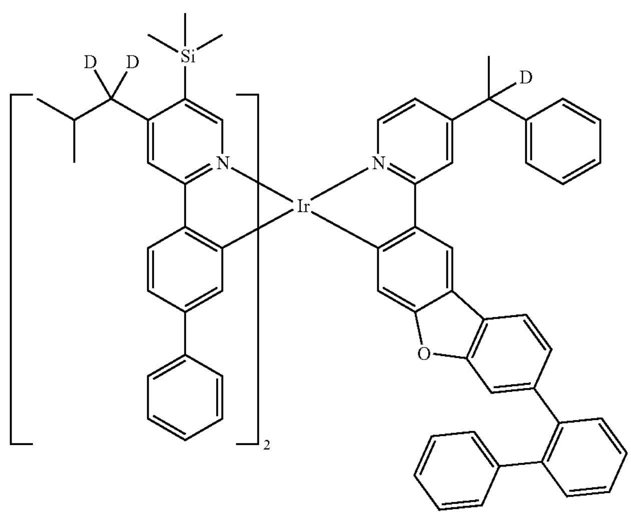

-continued
2671
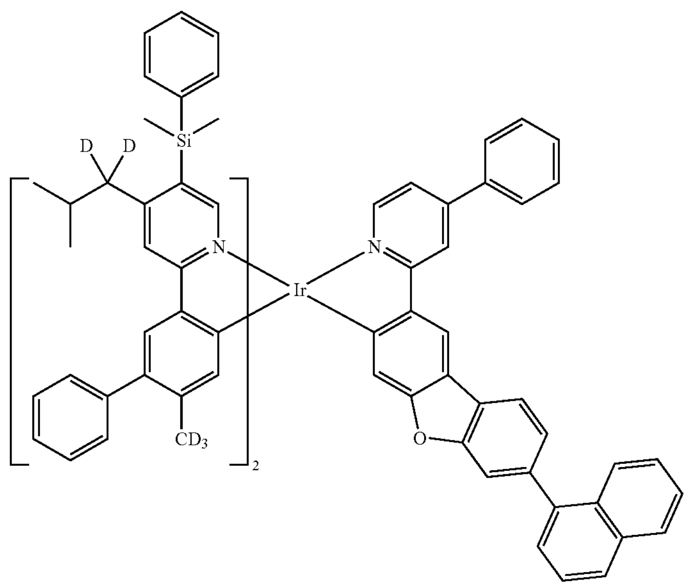
2672
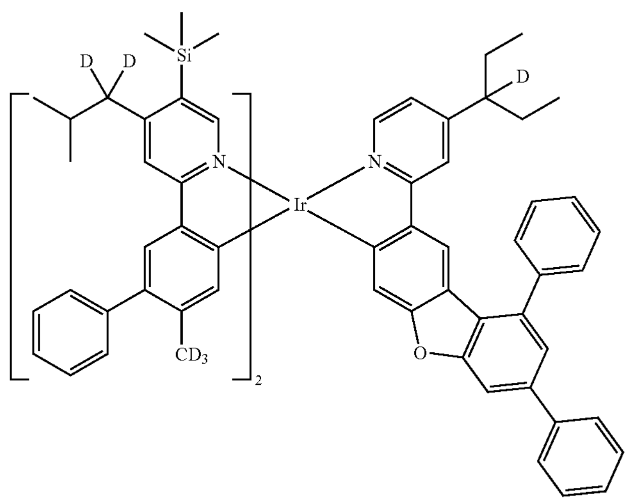
2673
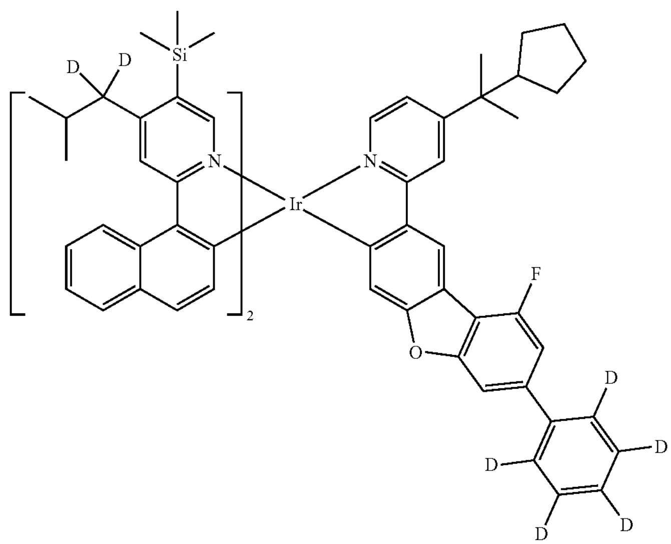

-continued
2674
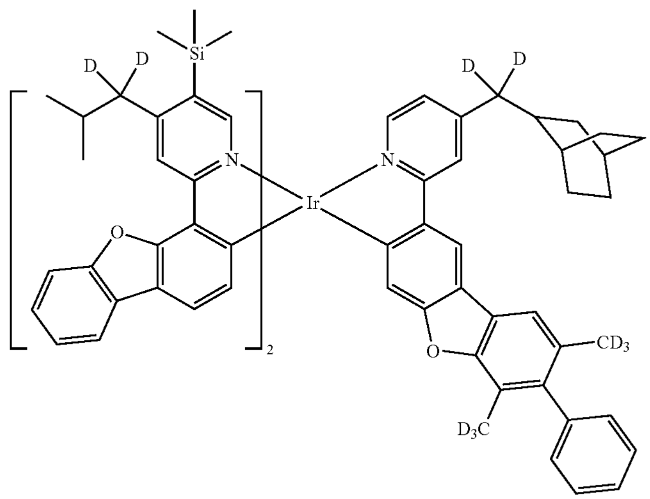
2675
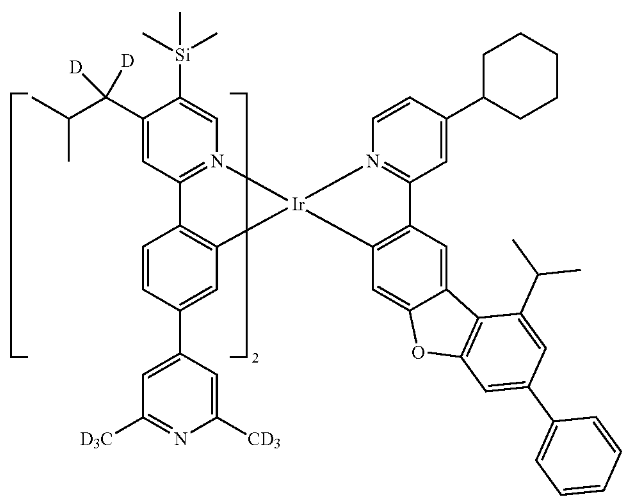
2676
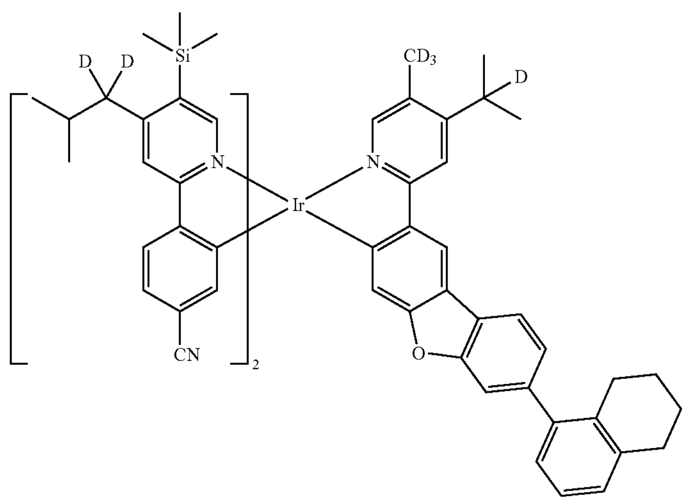

-continued
2677
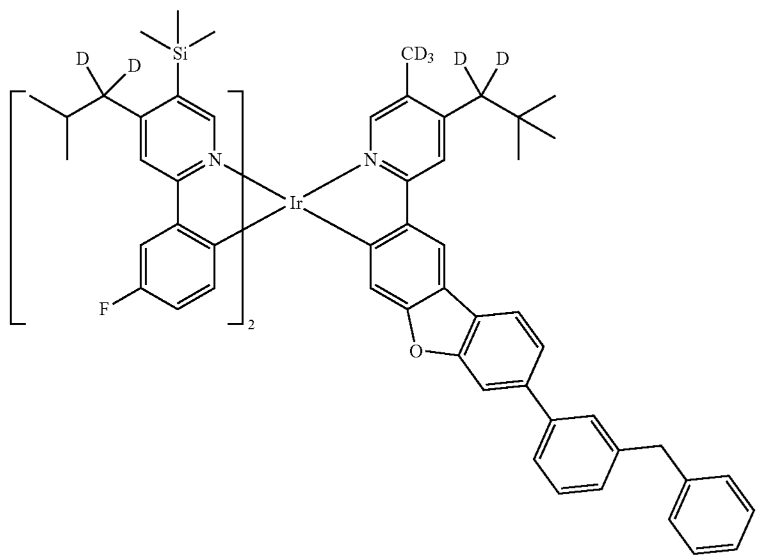
2678
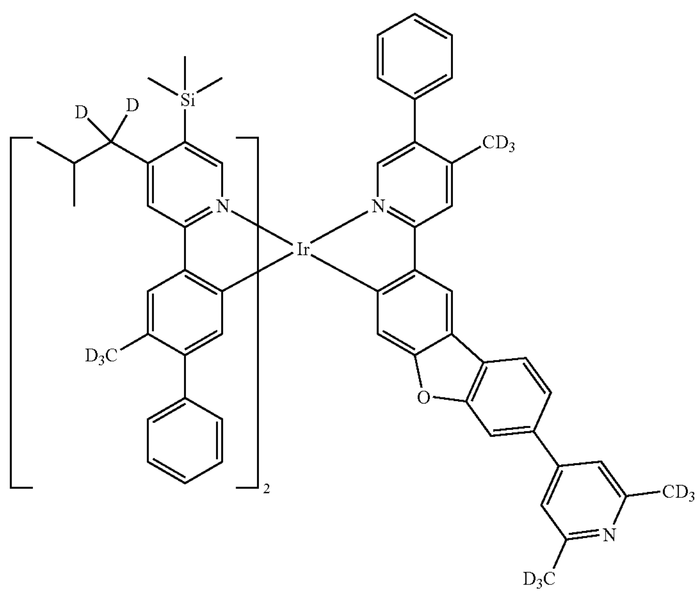
2679
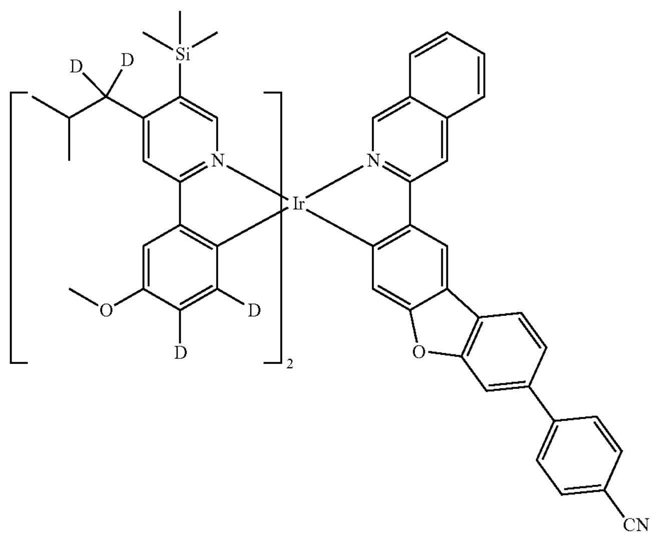

-continued
2680
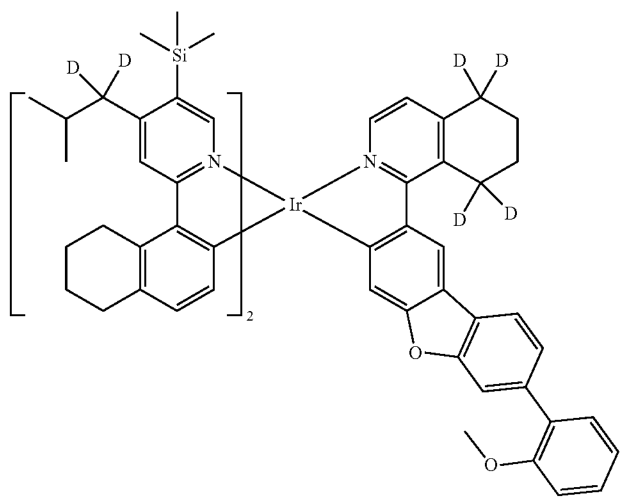
2681
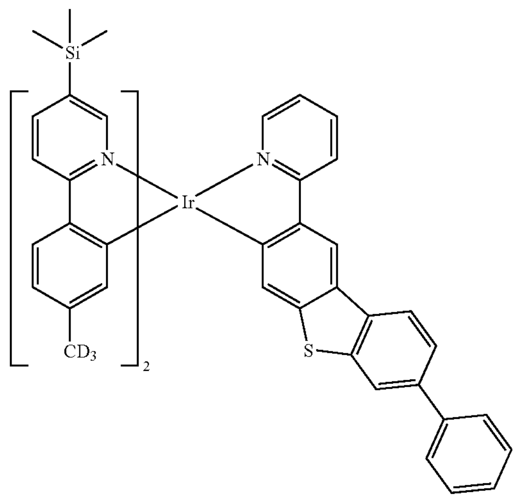
2682
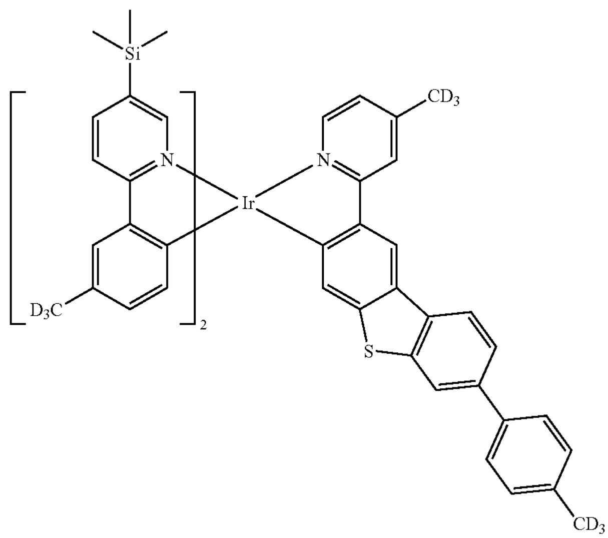

-continued
2683
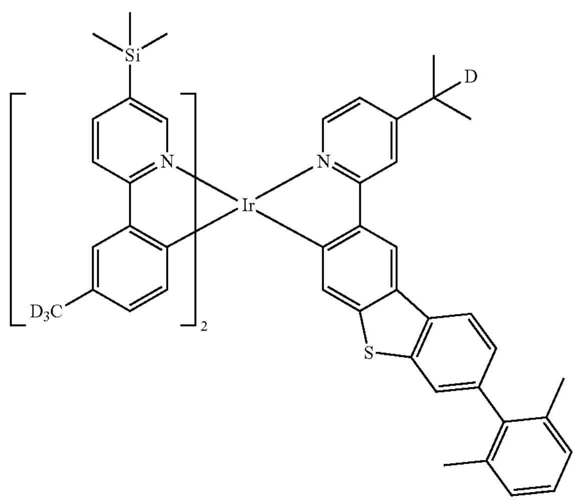
2684
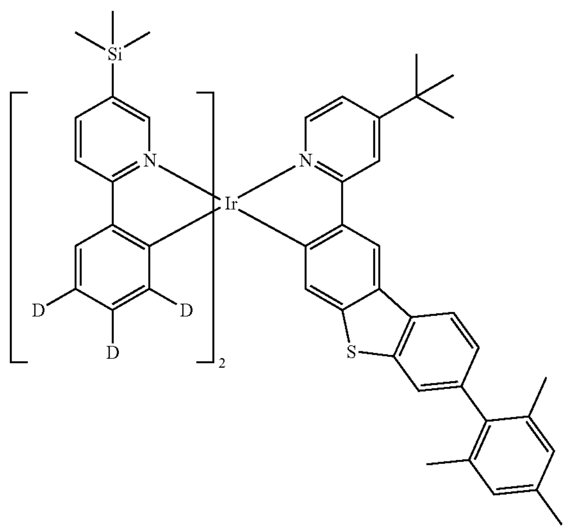
2685
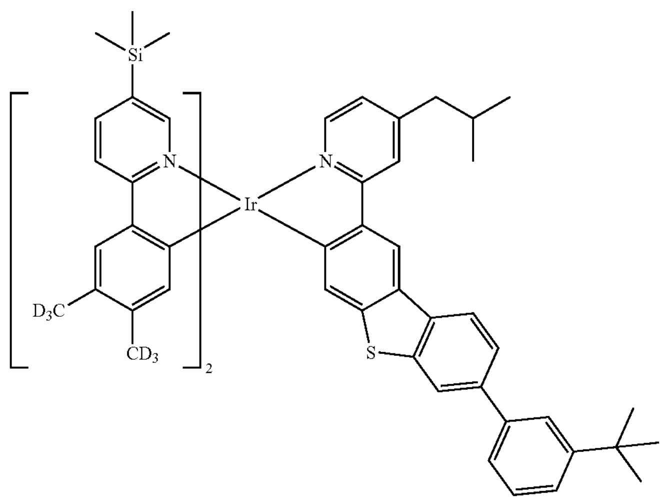

-continued
2686
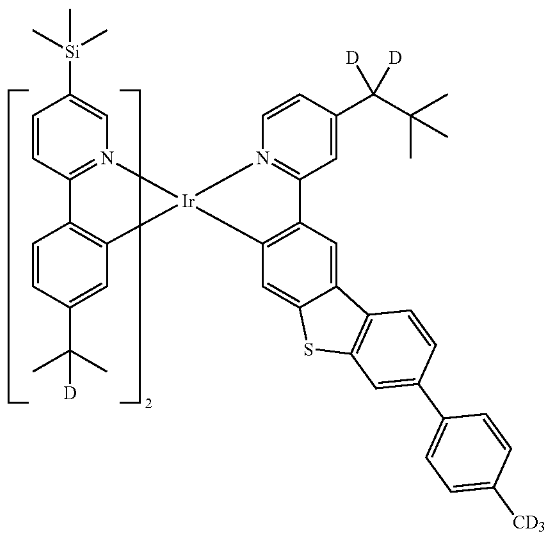
2687
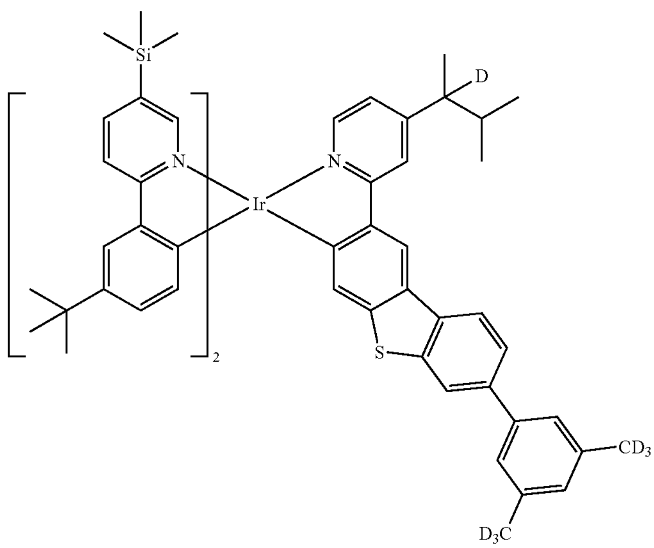
2688
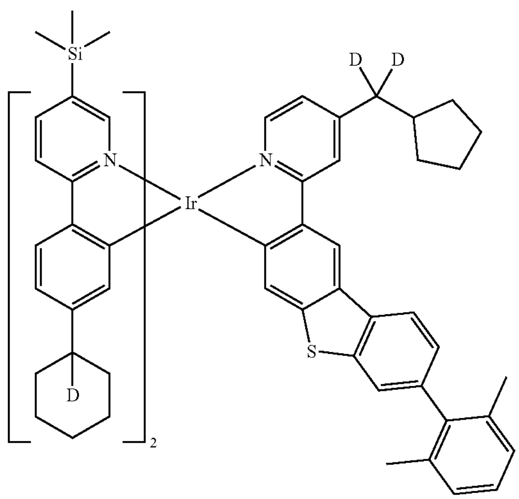

-continued
2689
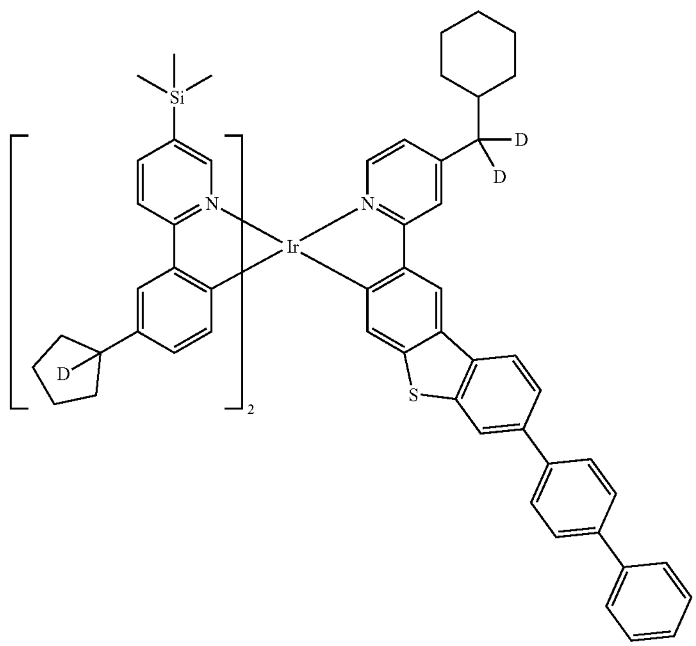
2690
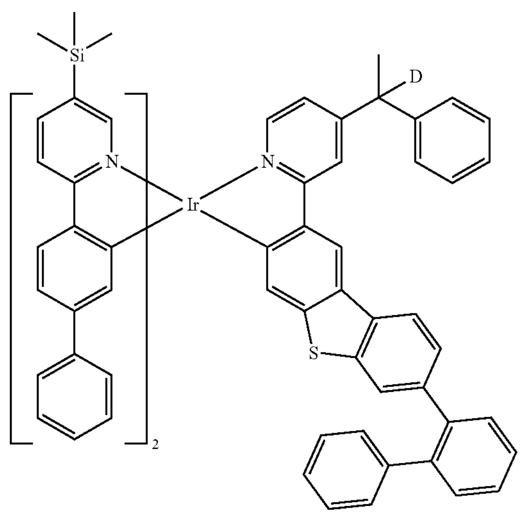
2691
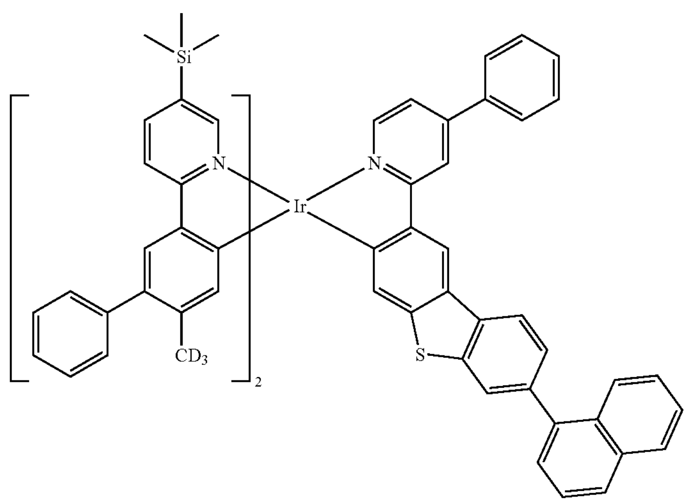

-continued
2692
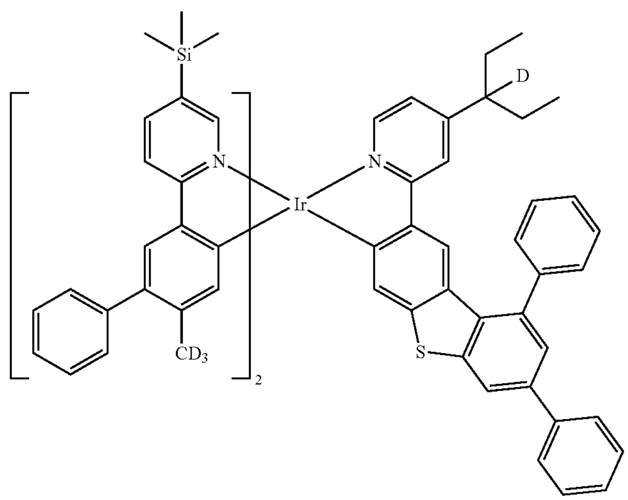
2693
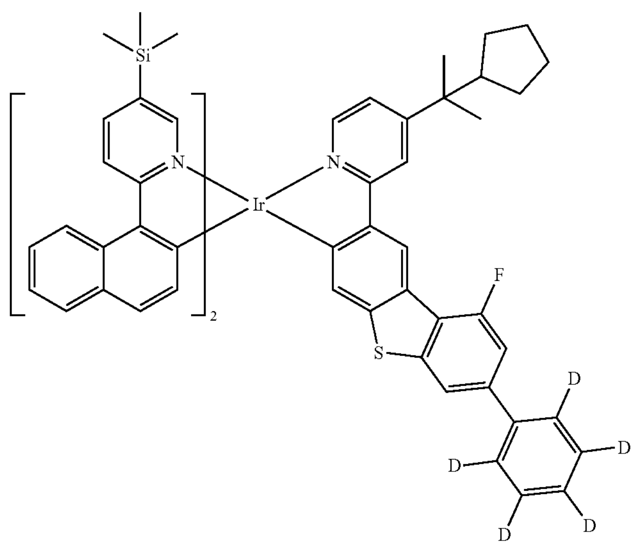
2694
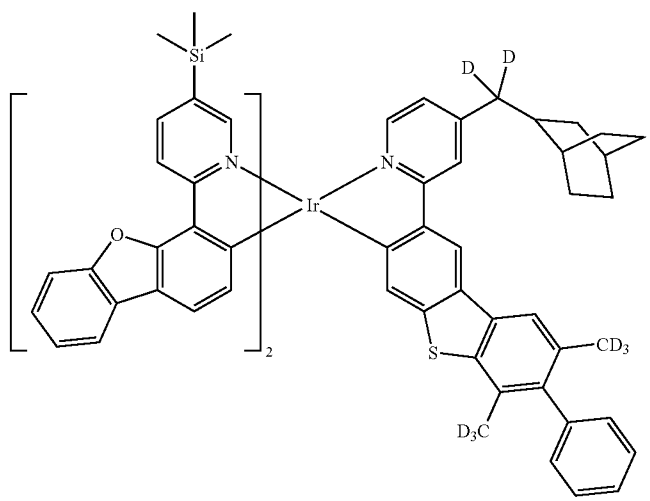

-continued
2695
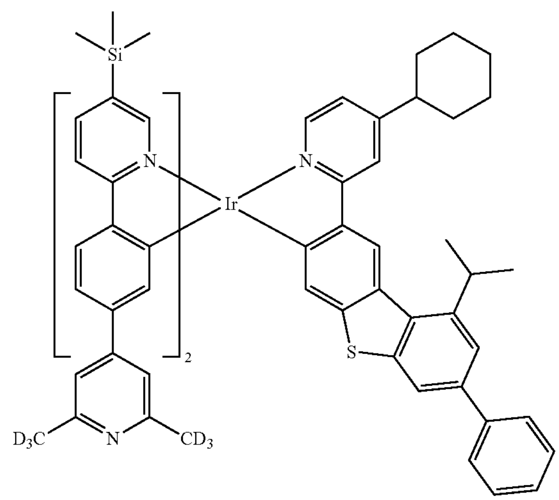
2696
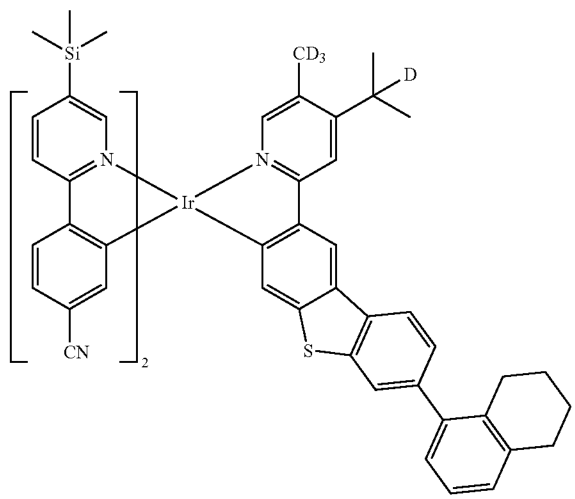
2697
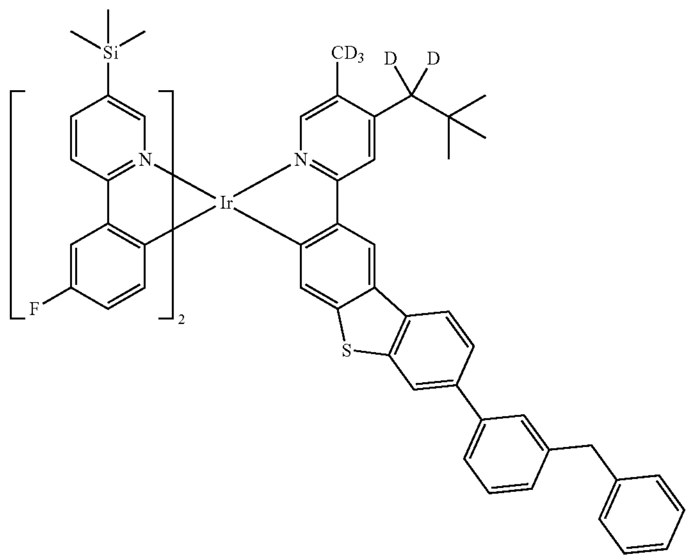

-continued
2698
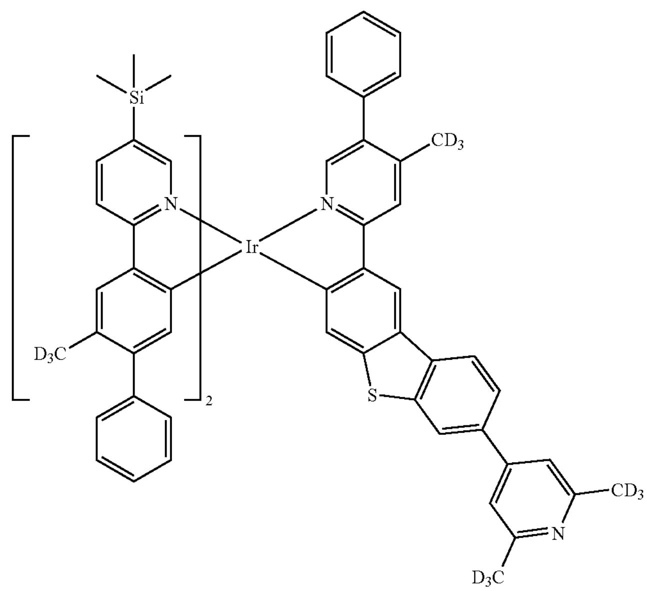
2699
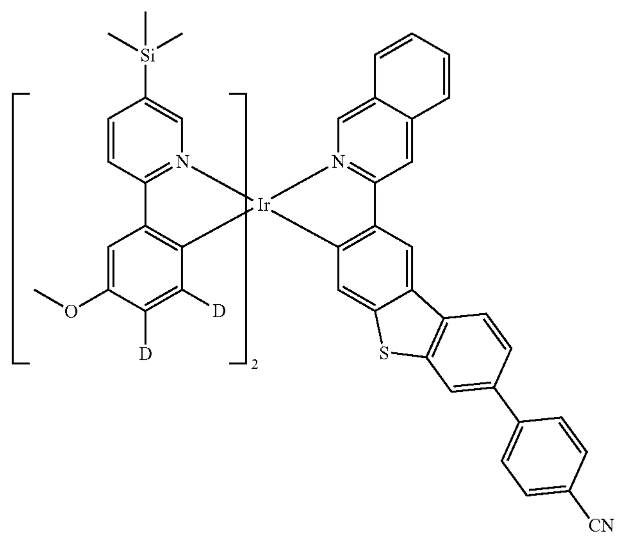
2700
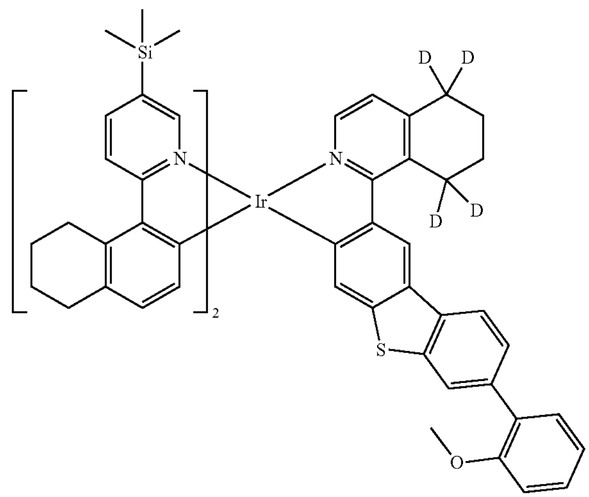

-continued
2701
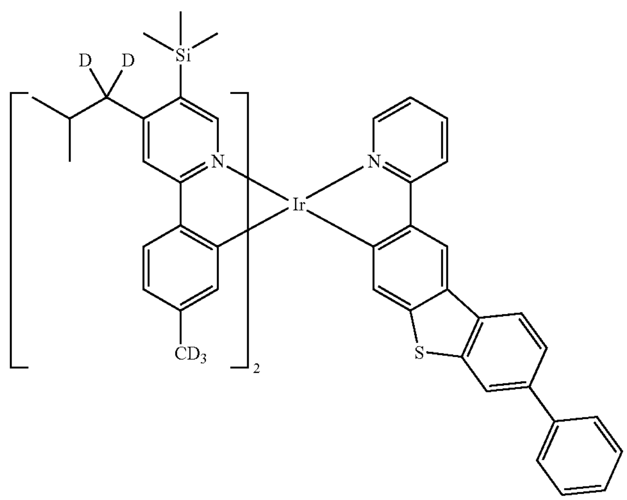
2702
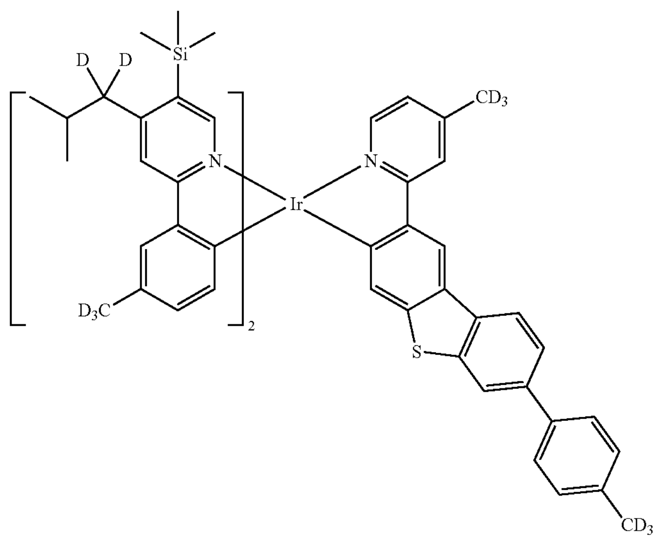
2703
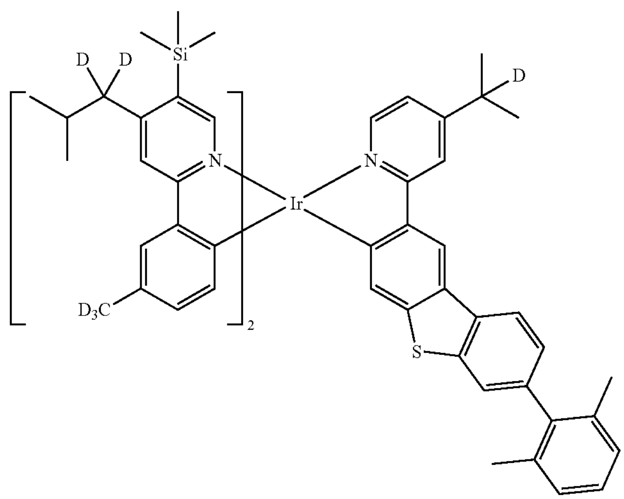

-continued
2704
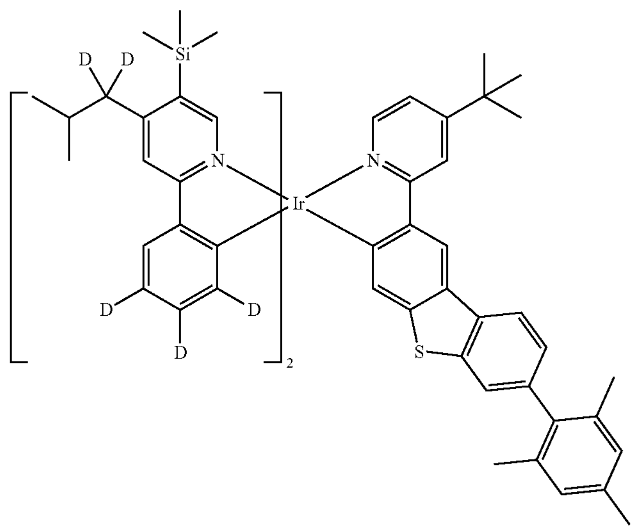
2705
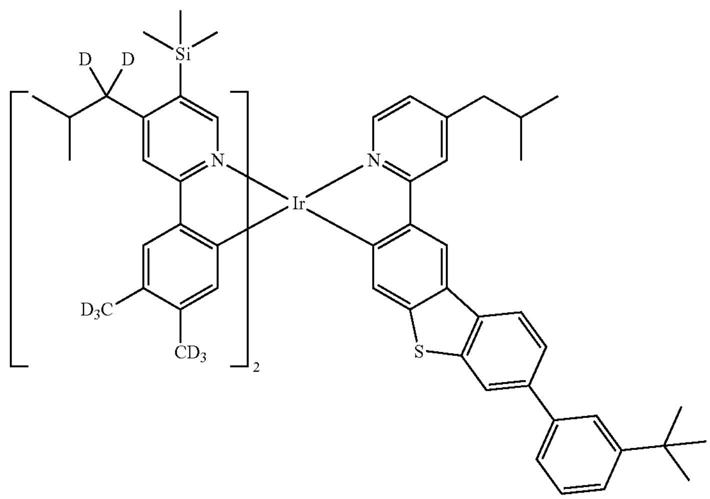
2706
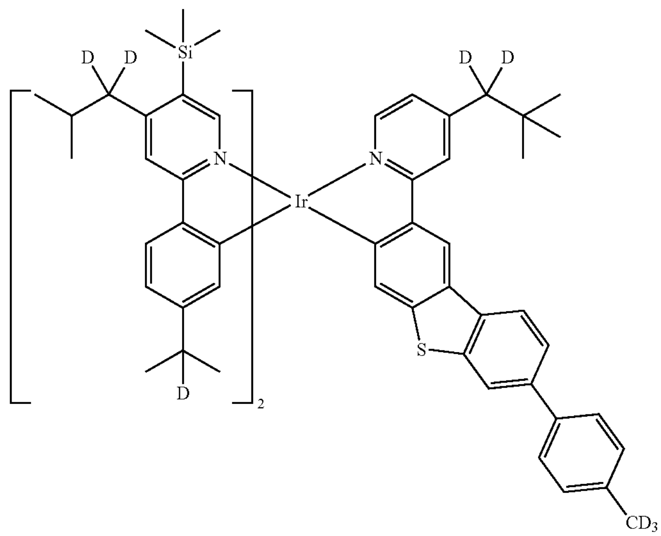

-continued
2707
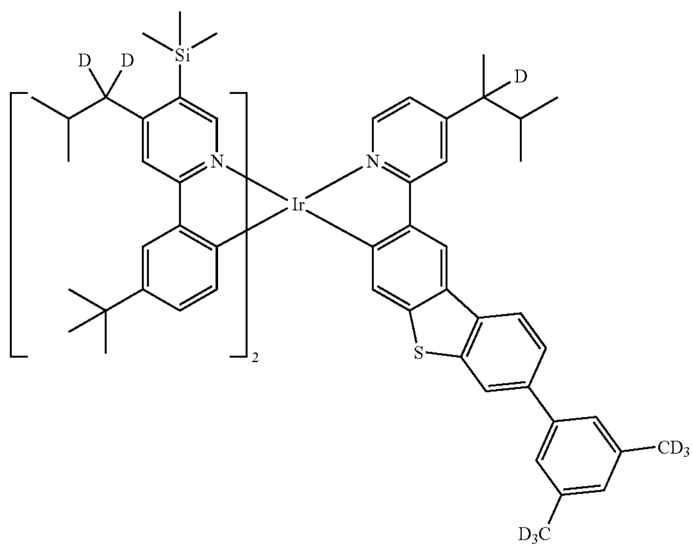
2708
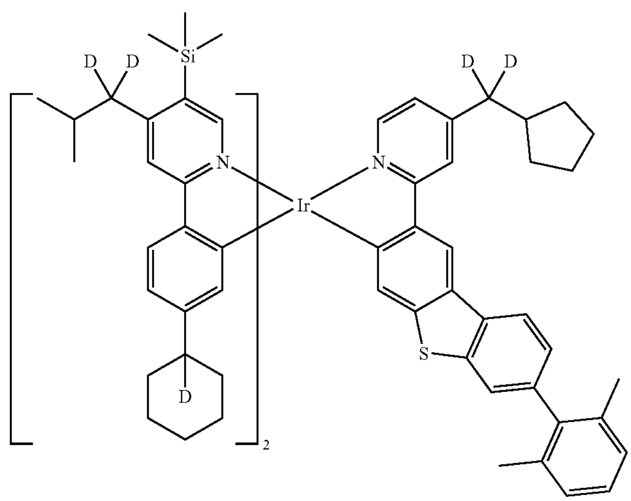

-continued
2709
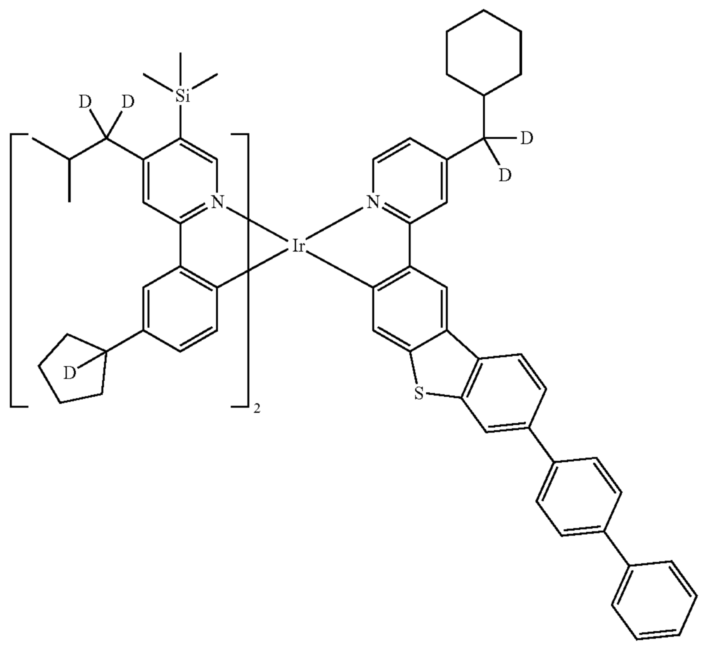
2710
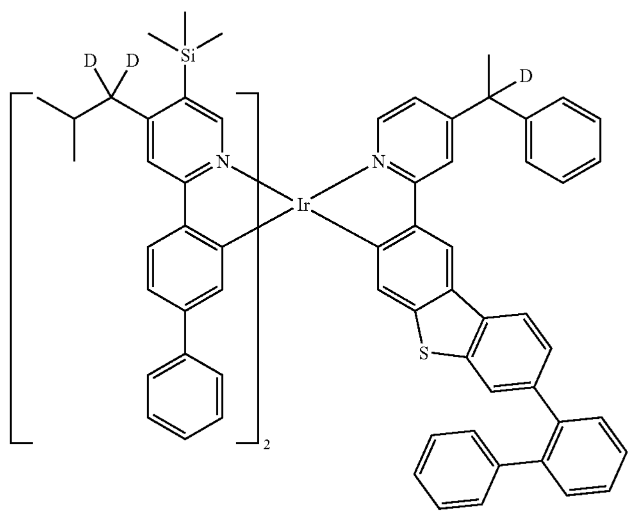

-continued
2711
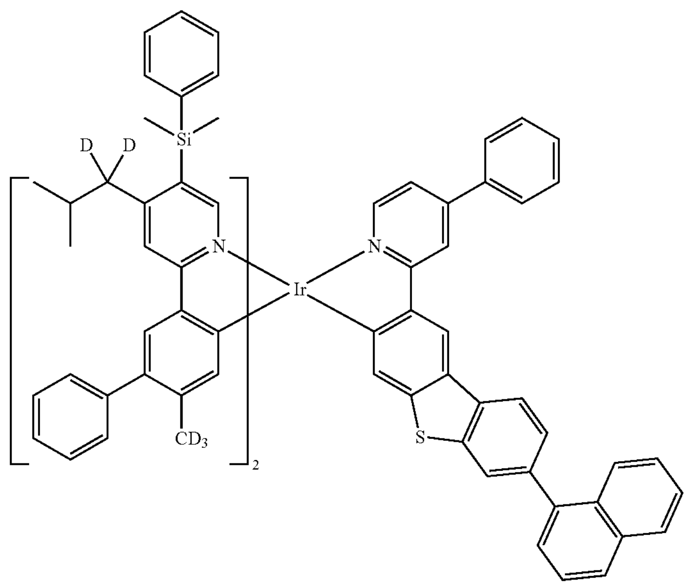
2712
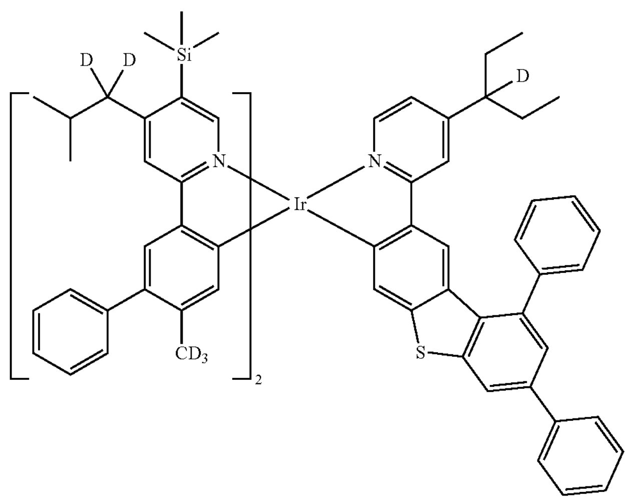
2713
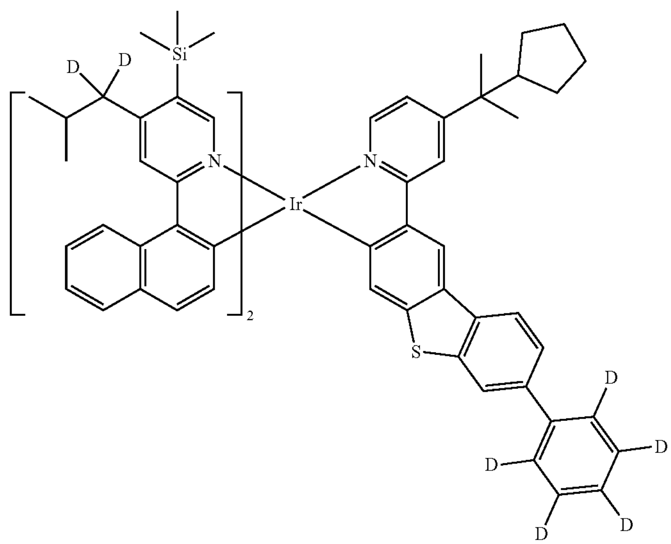

-continued
2714
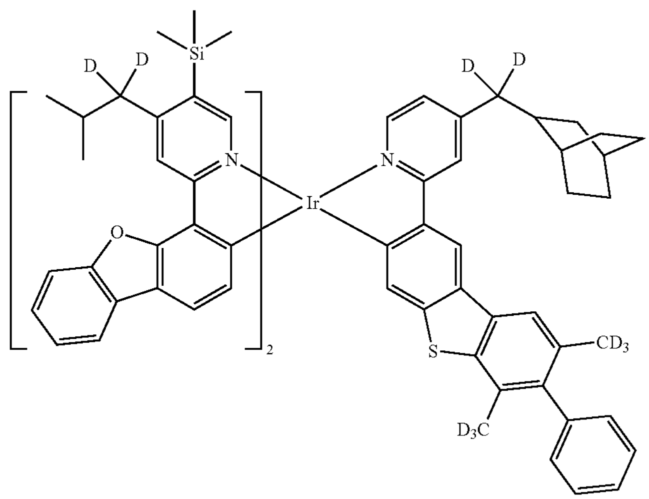
2715
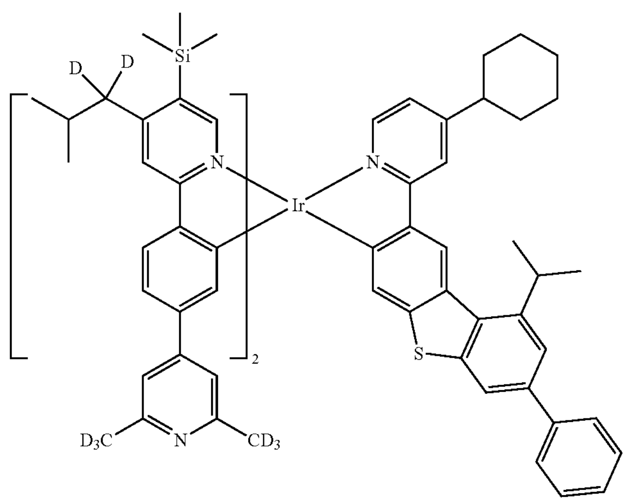
2716
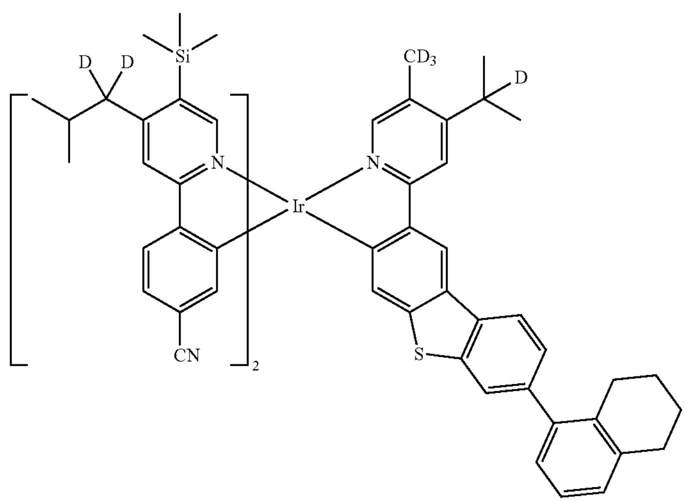

-continued
2717
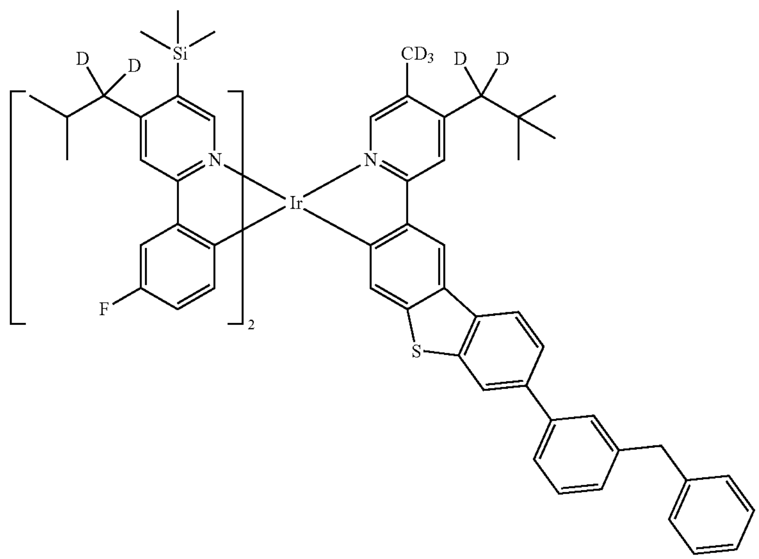
2718
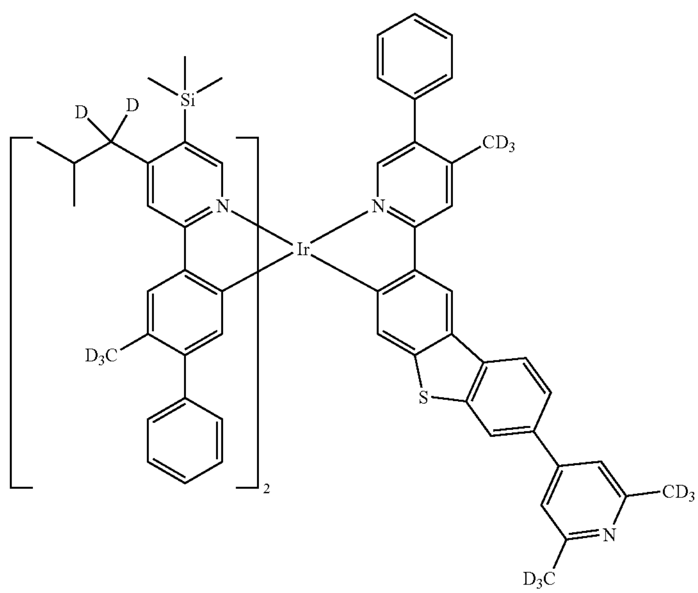
2719
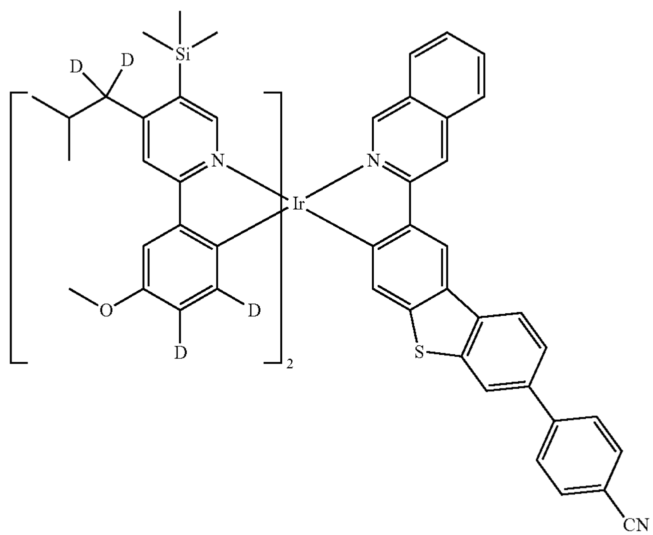

-continued
2720
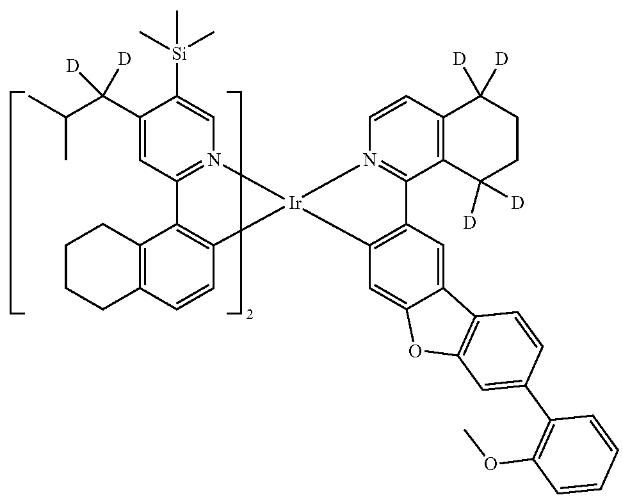
2721
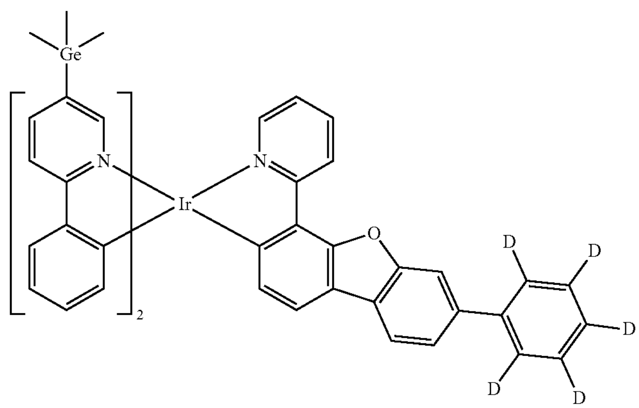
2722
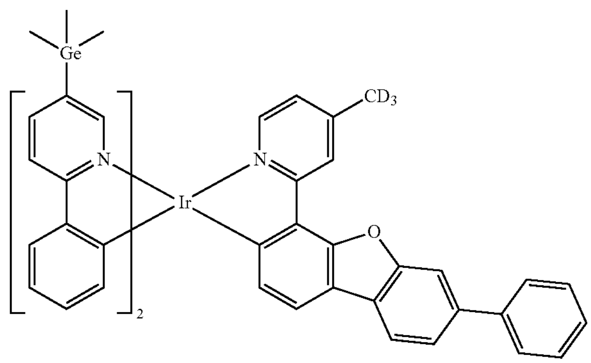
2723
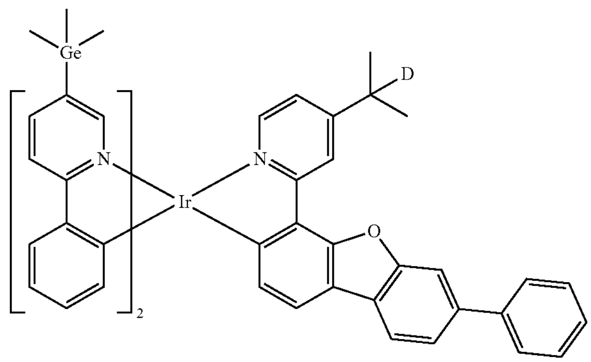

-continued
2724
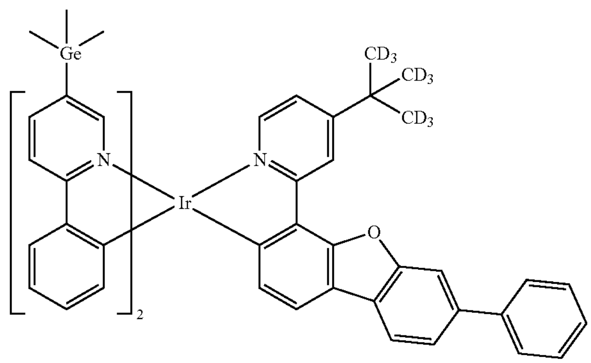
2725
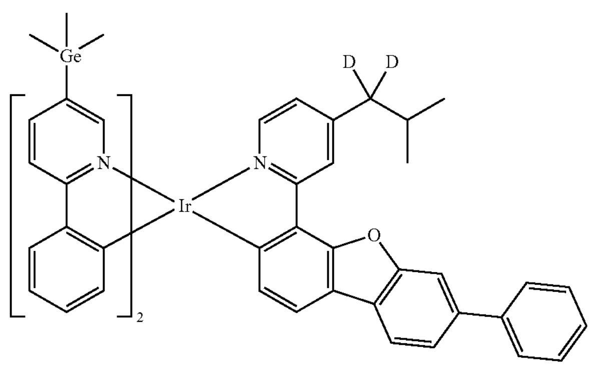
2726
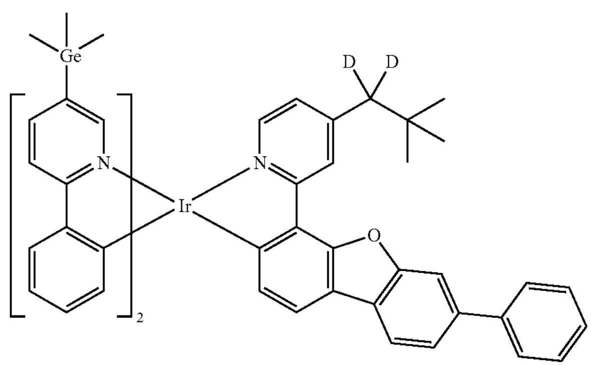
2727
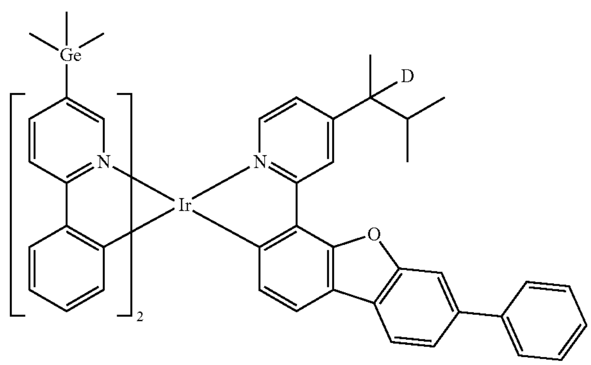

-continued
2728
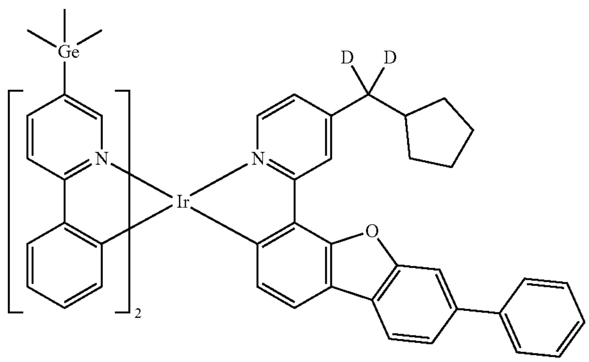
2729
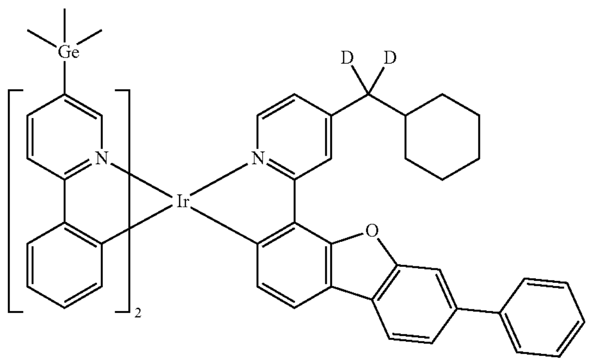
2730
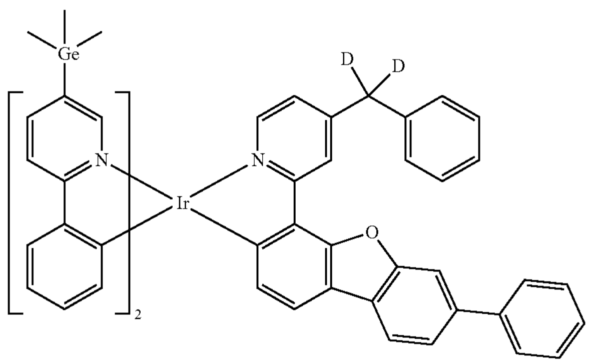
2731
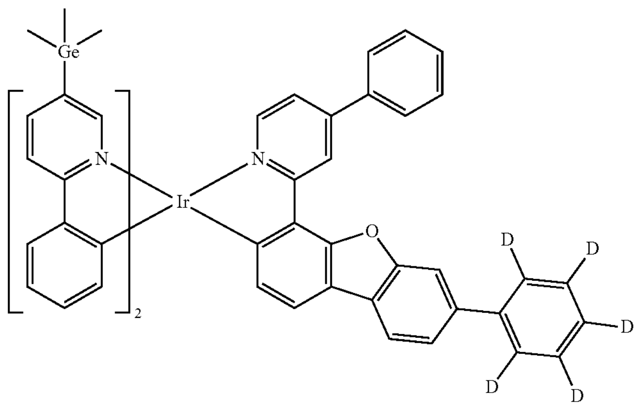

-continued
2732
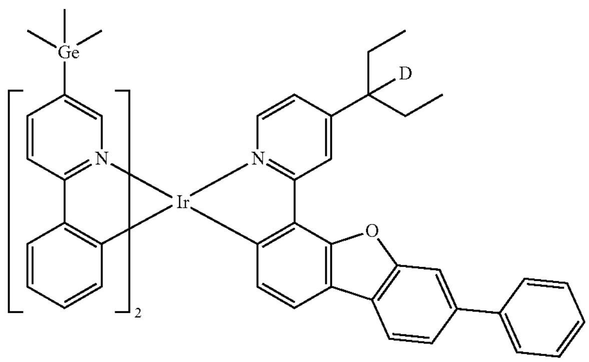
2733
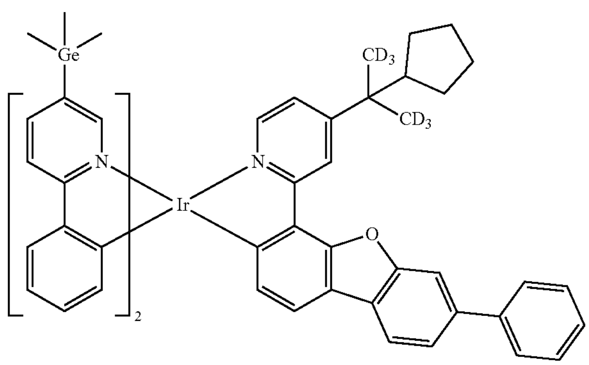
2734
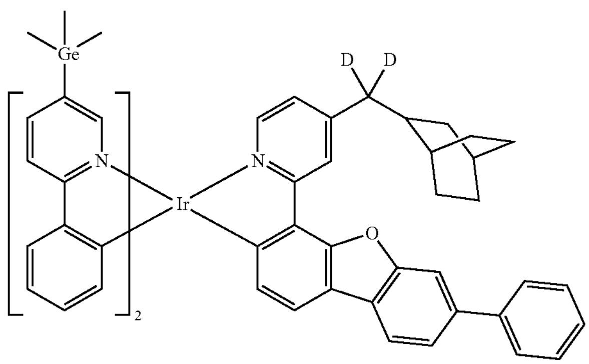
2735
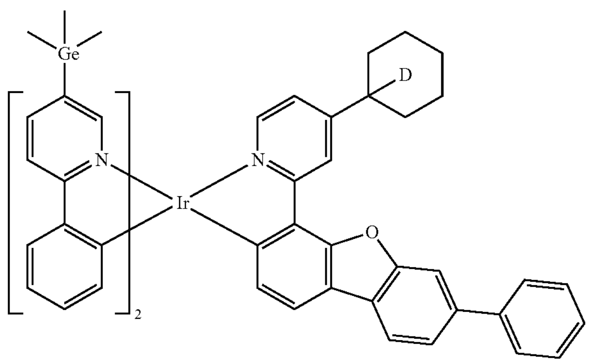

-continued
2736
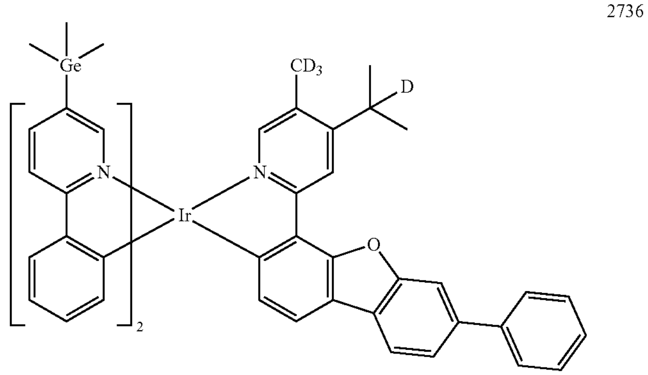
2737
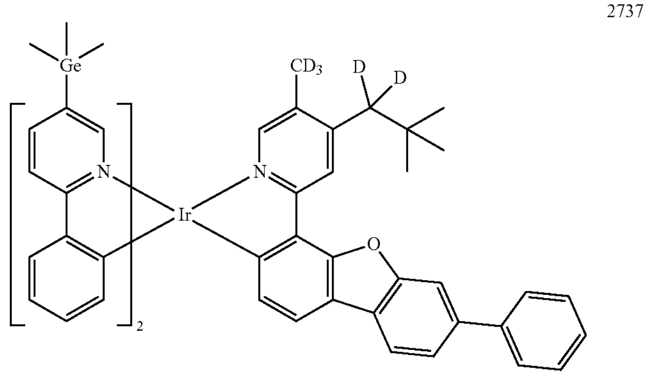
2738
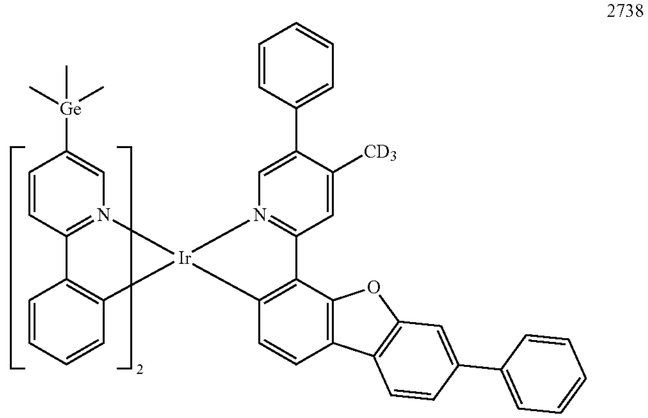
2739
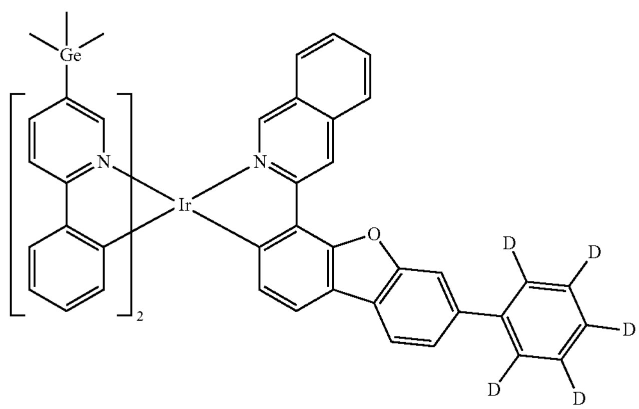

-continued
2740
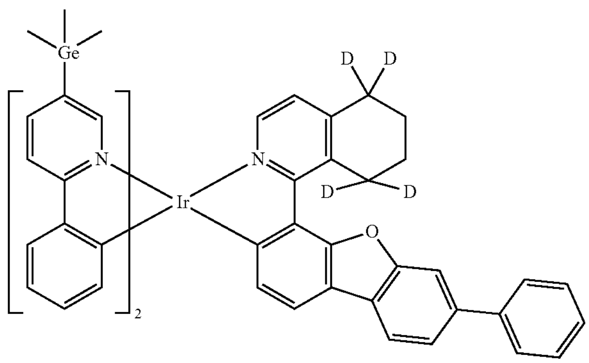
2741
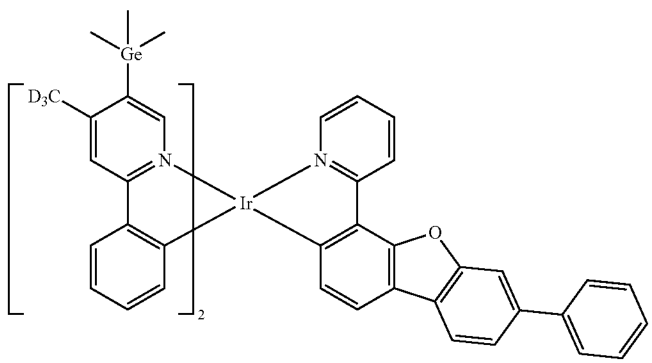
2742
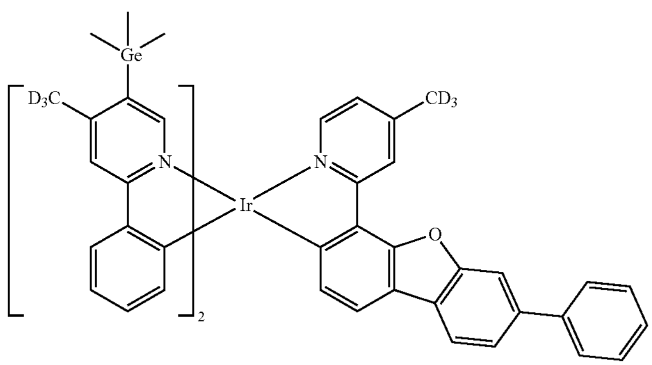
2743
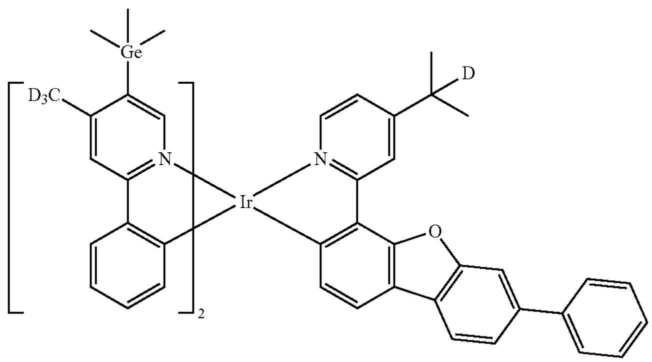

-continued
2744
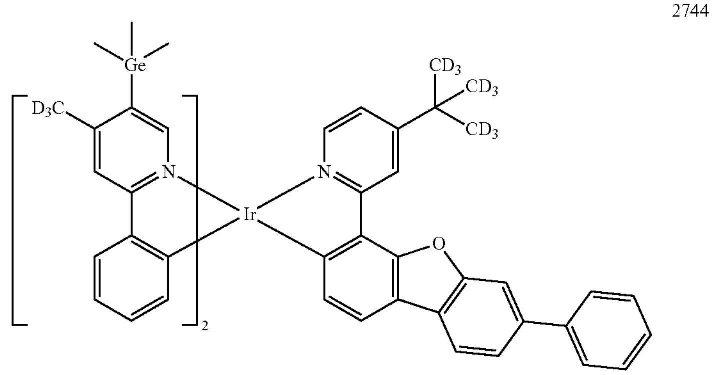
2745
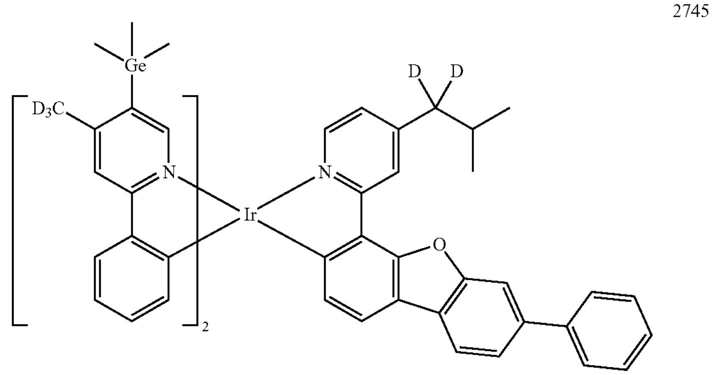
2746
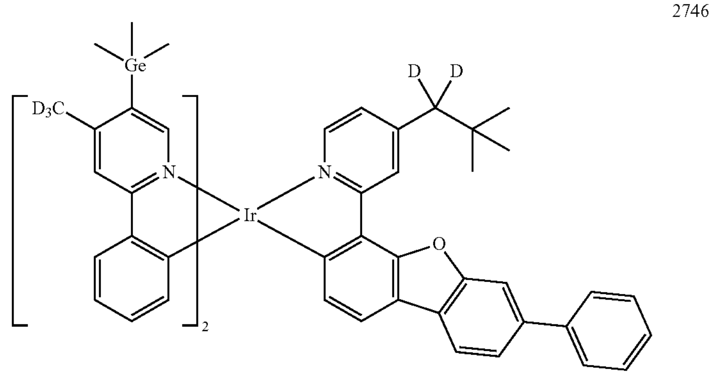
2747
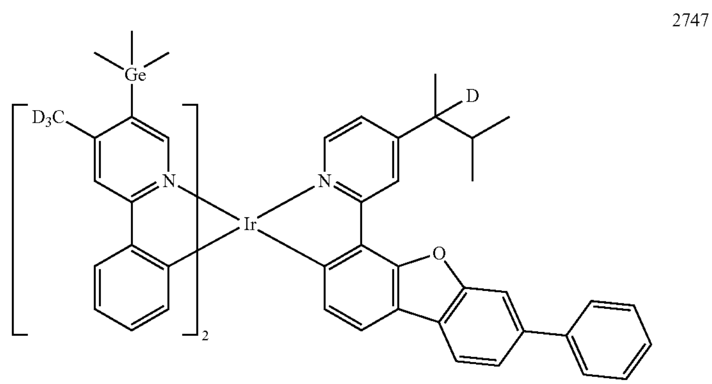

-continued
2748
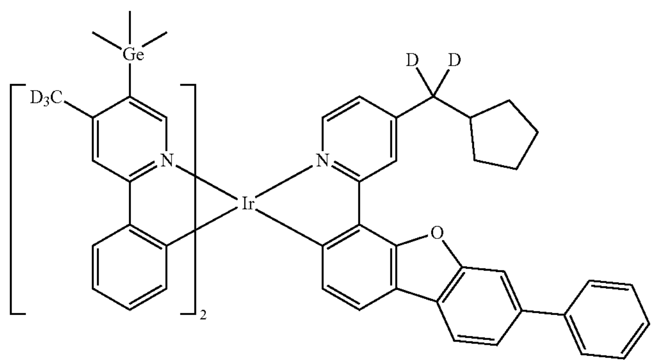
2749
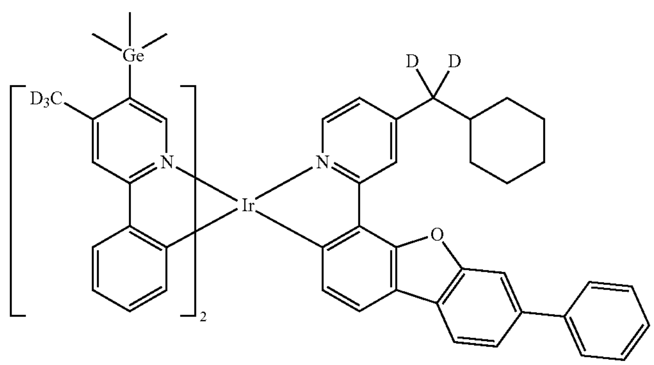
2450
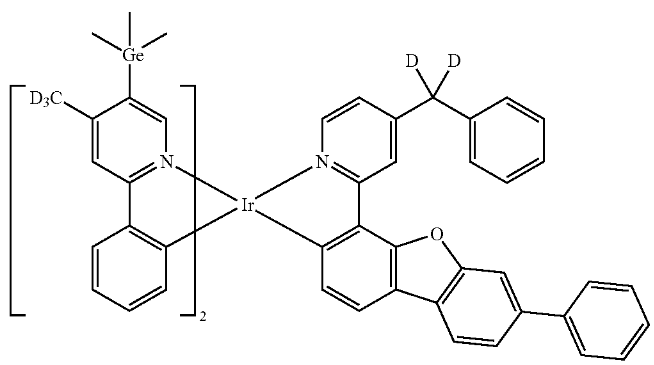
2751
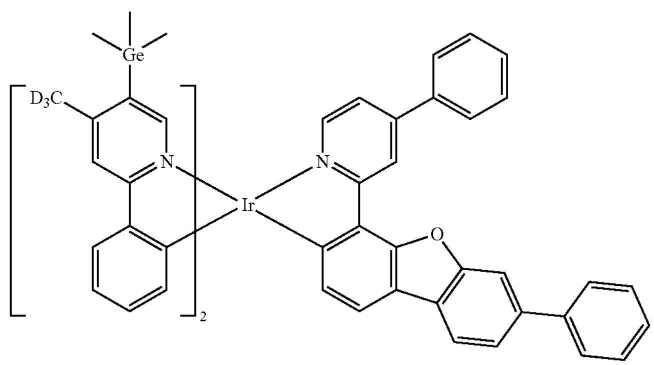

-continued
2752
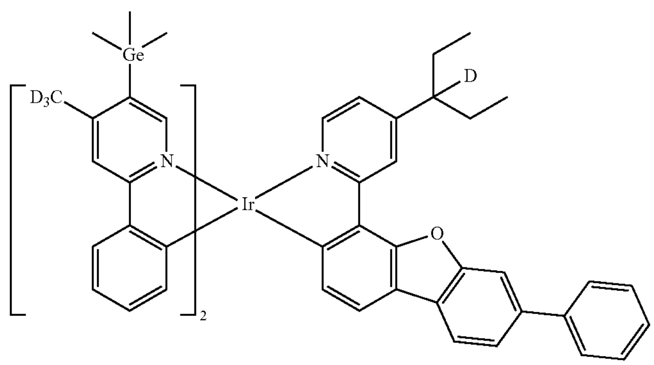
2753
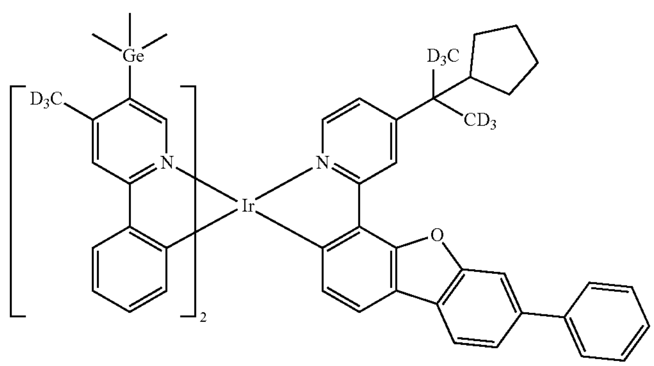
2754
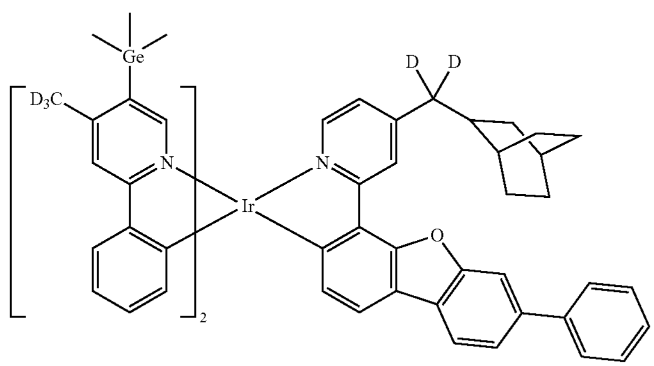
2755
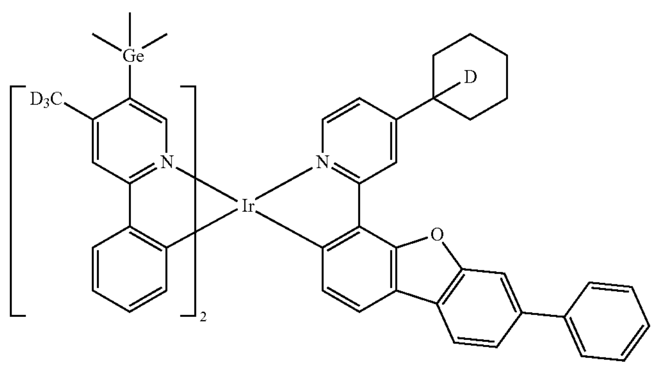

-continued
2756
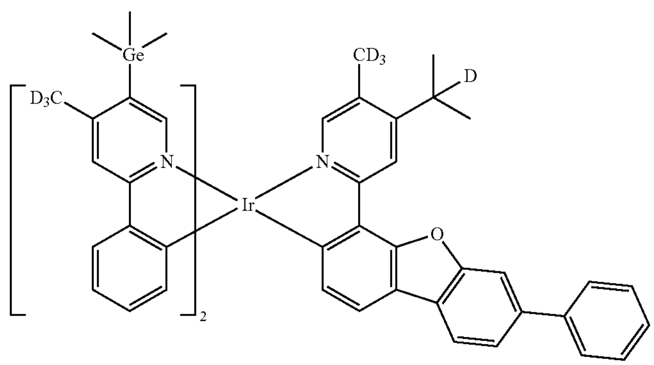
2757
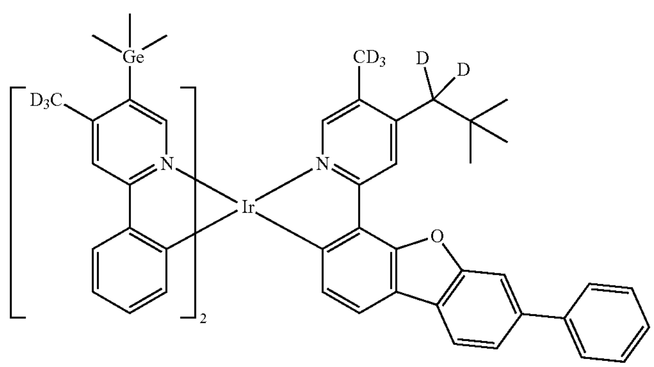
2758
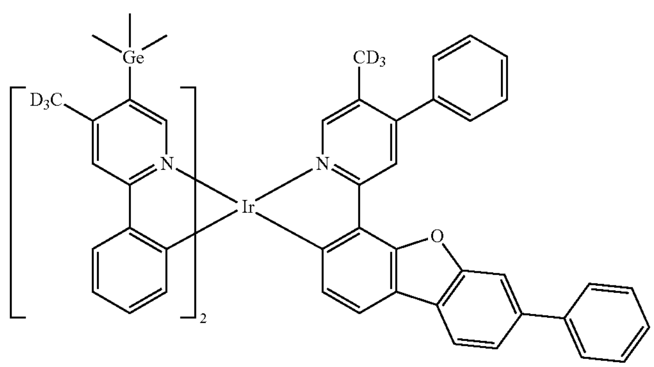
2759
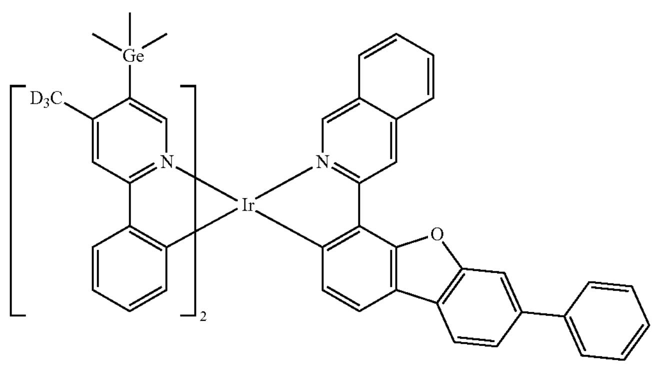

-continued
2760
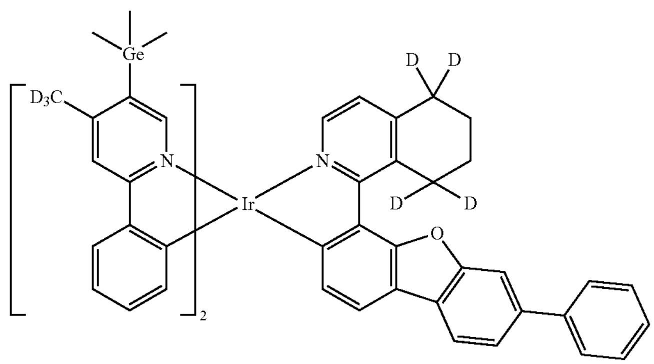
2761
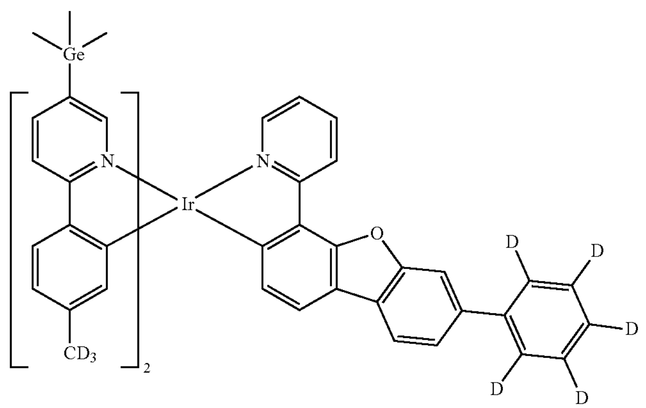
2762
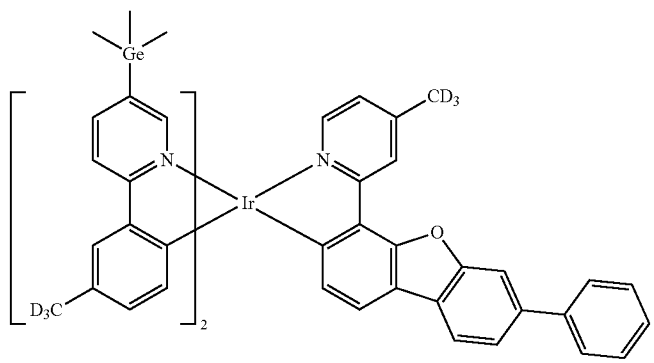
2763
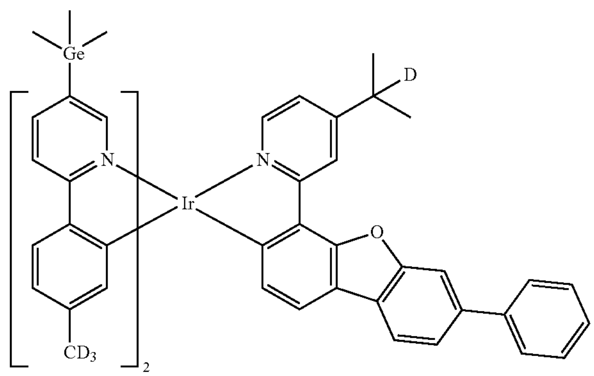

-continued
2764
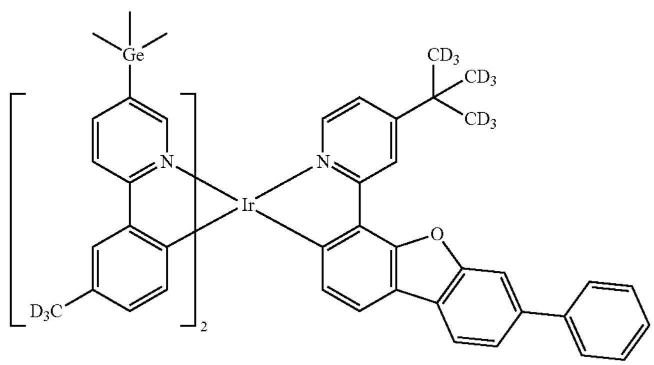
2765
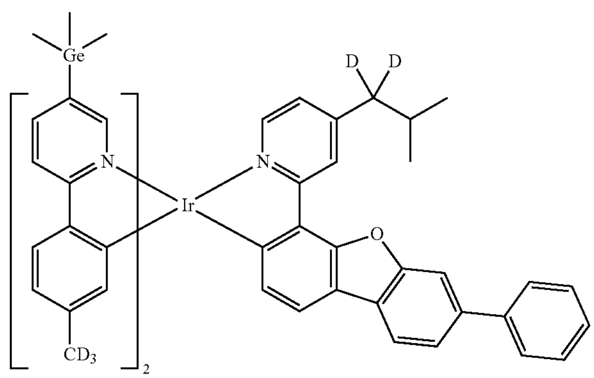
2766
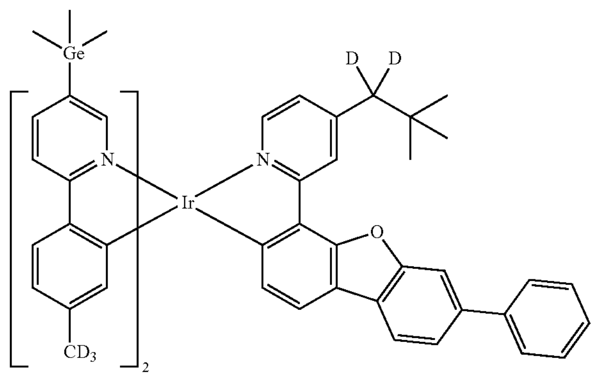
2767
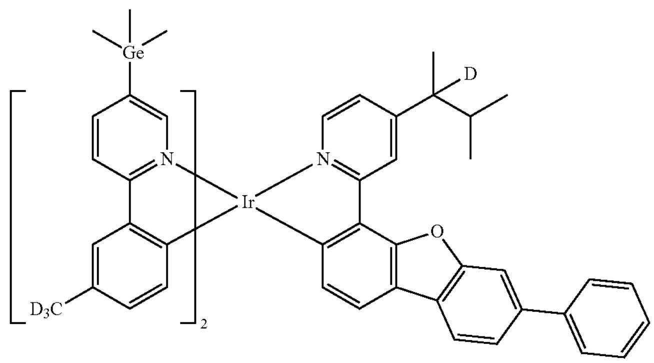

-continued
2768
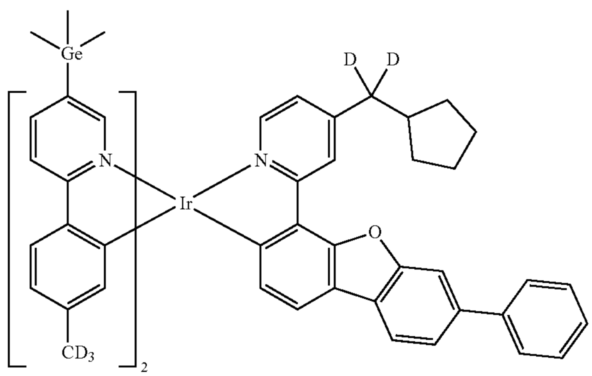
2769
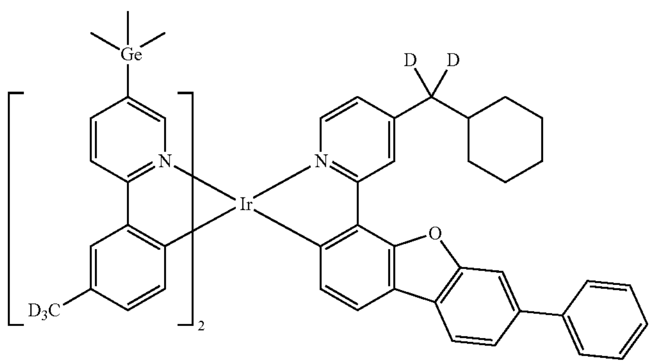
2770
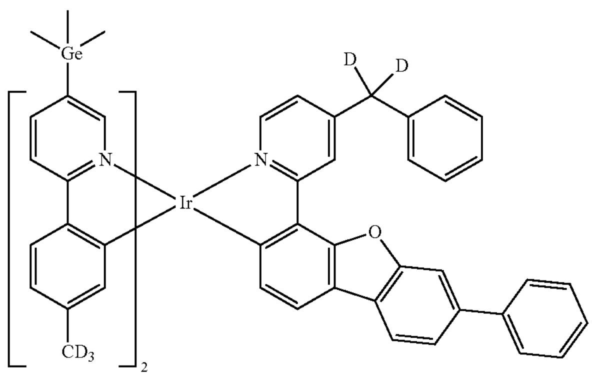
2771
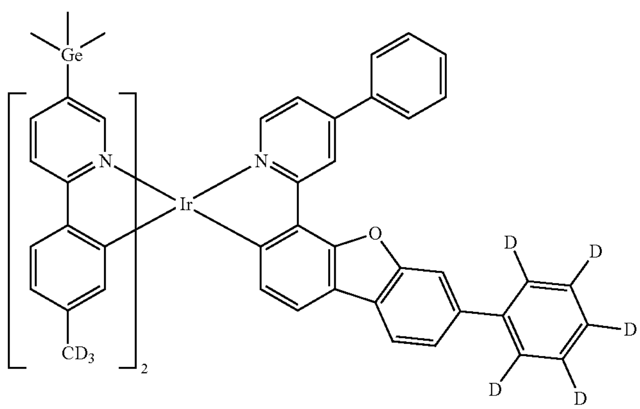

-continued
2772
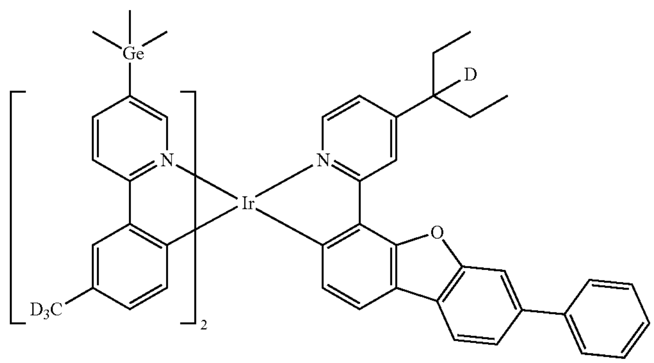
2773
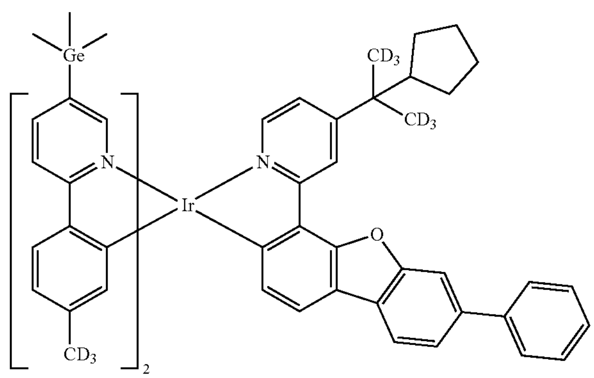
2774
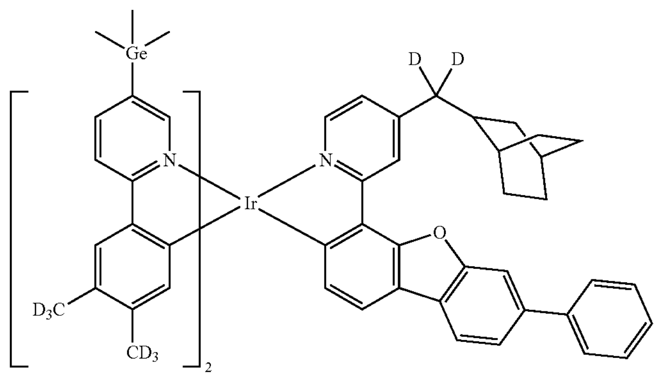
2775
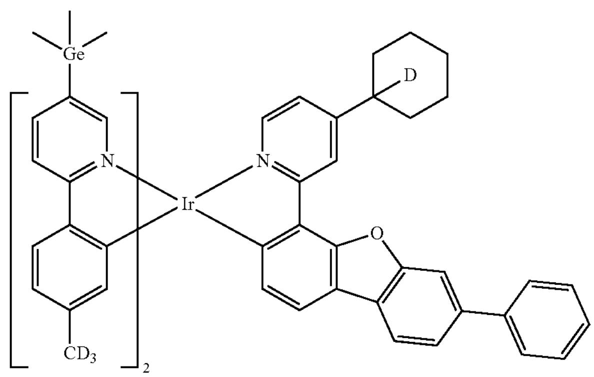

-continued
2776
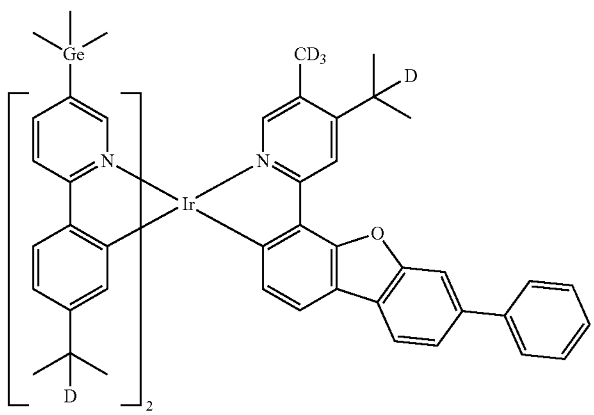
2777
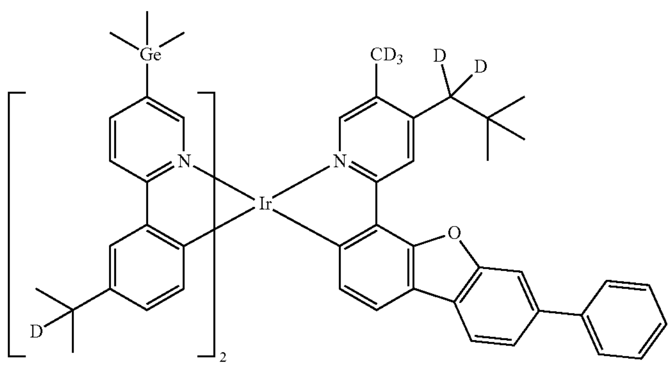
2778
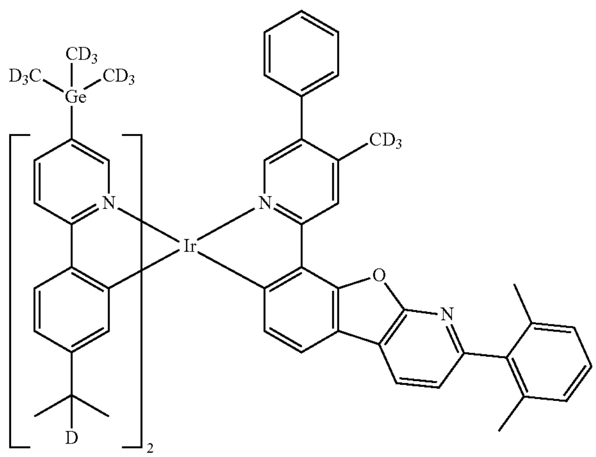
2779
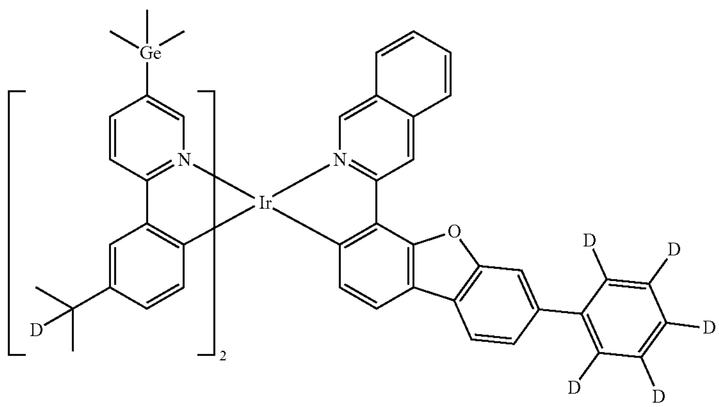

-continued
2780
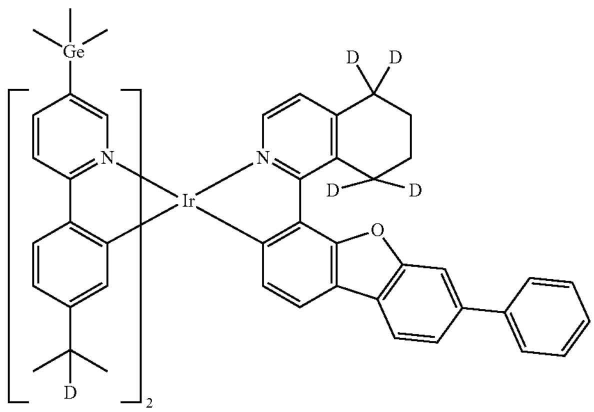
2781
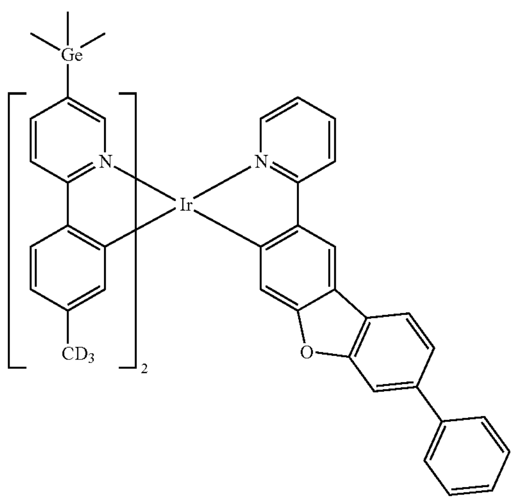
2782
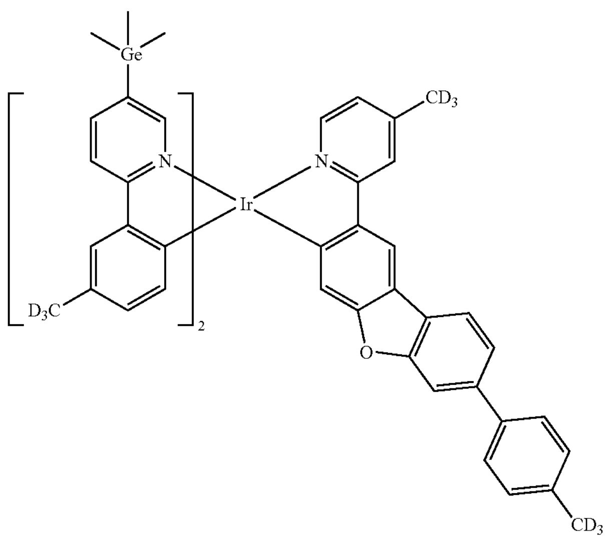

-continued
2783
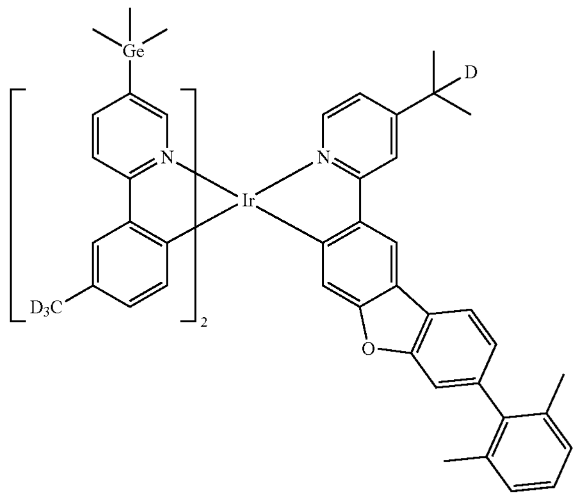
2784
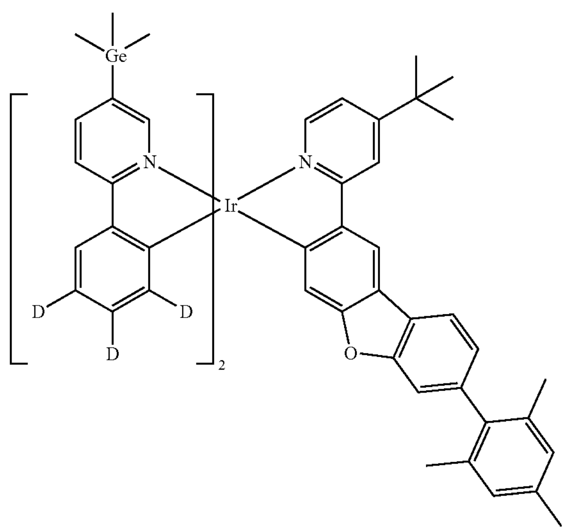
2785
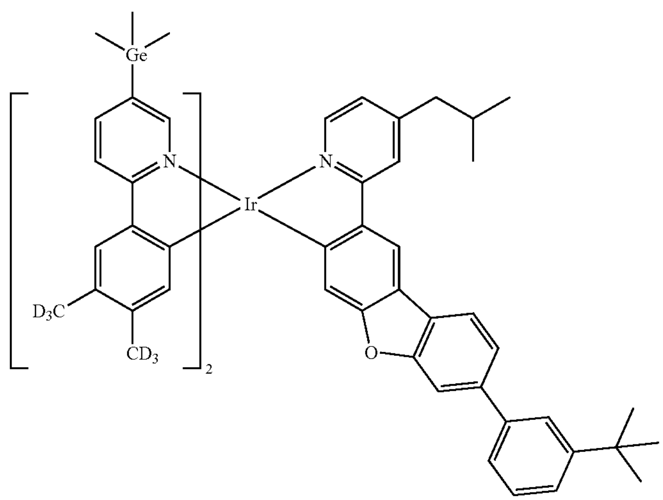

-continued
2786
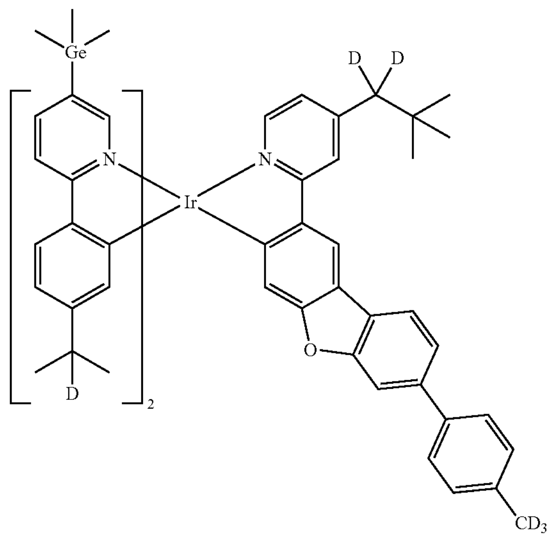
2787
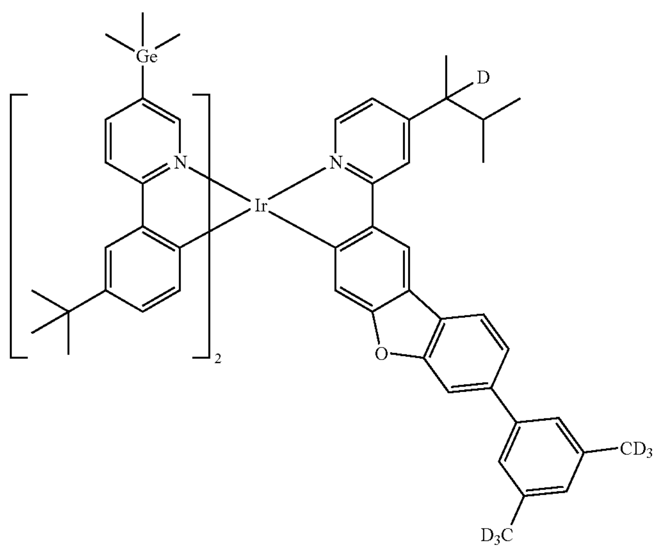
2788
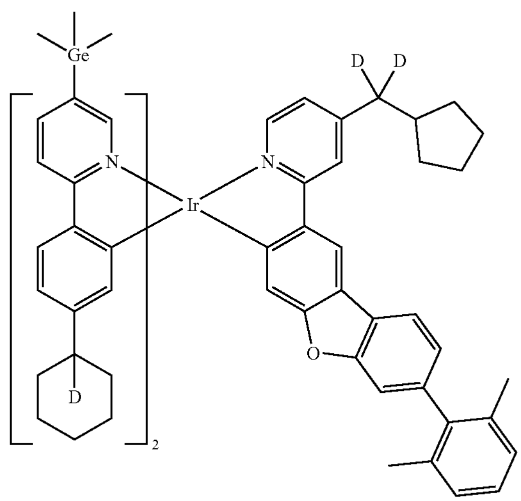

-continued
2789
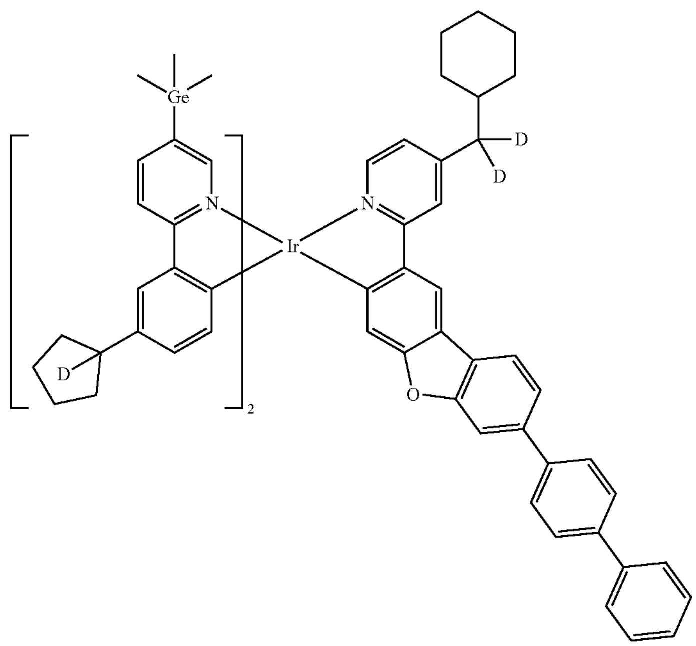
2790
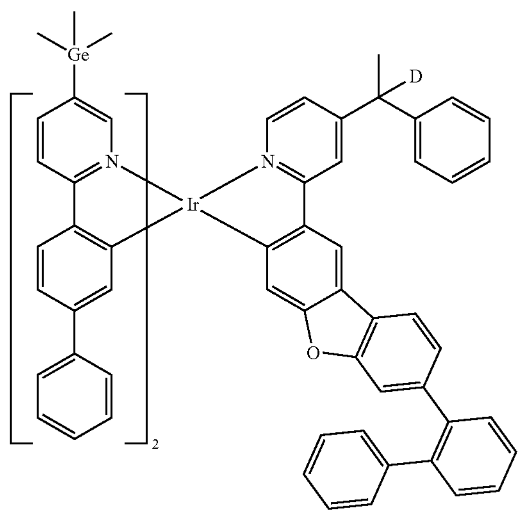
2791
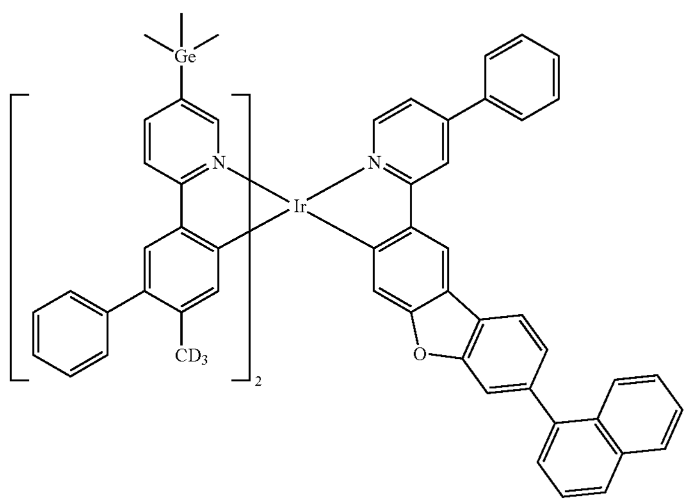

-continued
2792
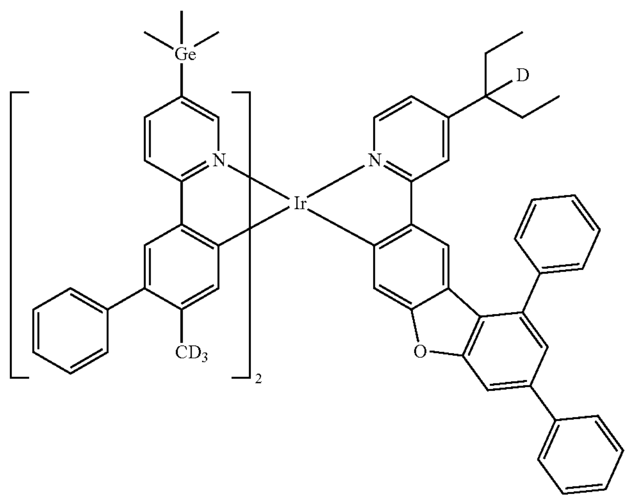
2793
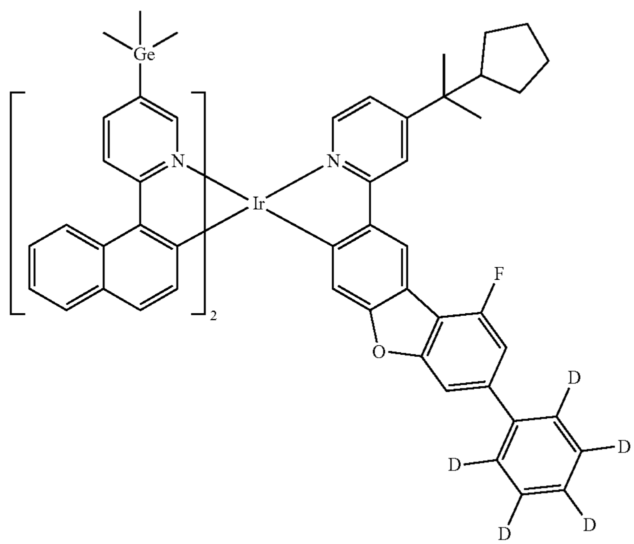
2794
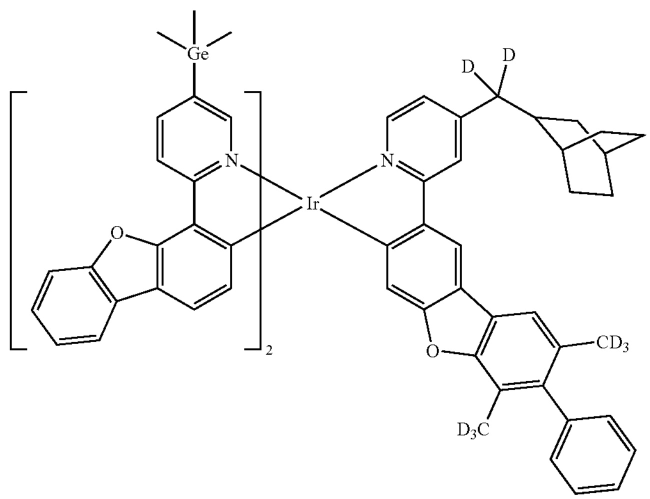

-continued
2795
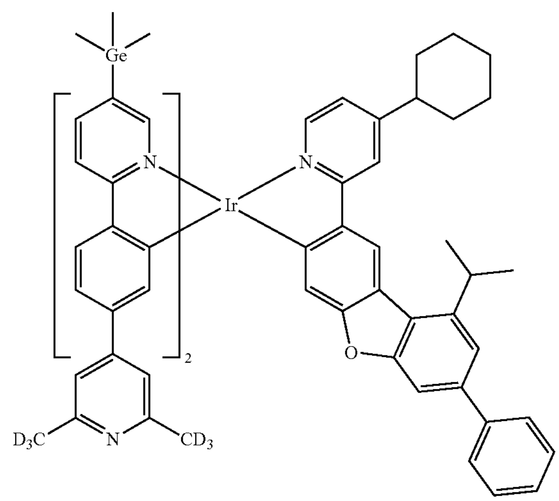
2796
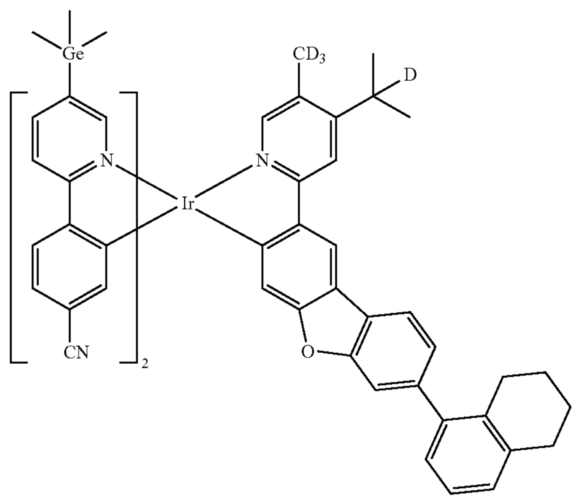
2797
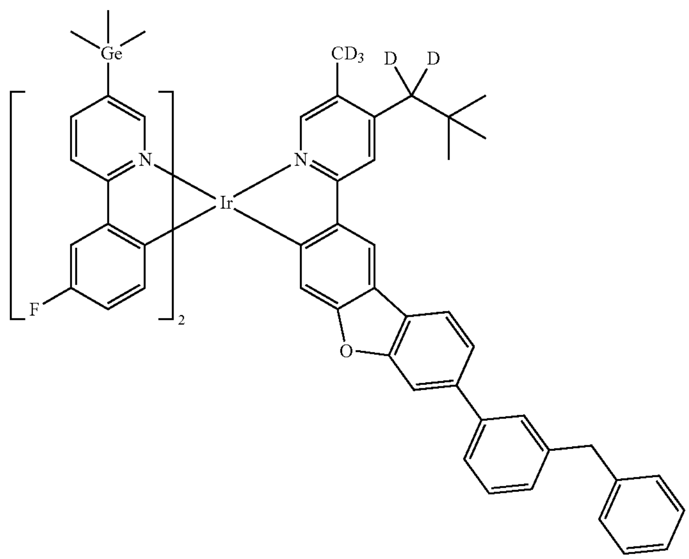

-continued
2798
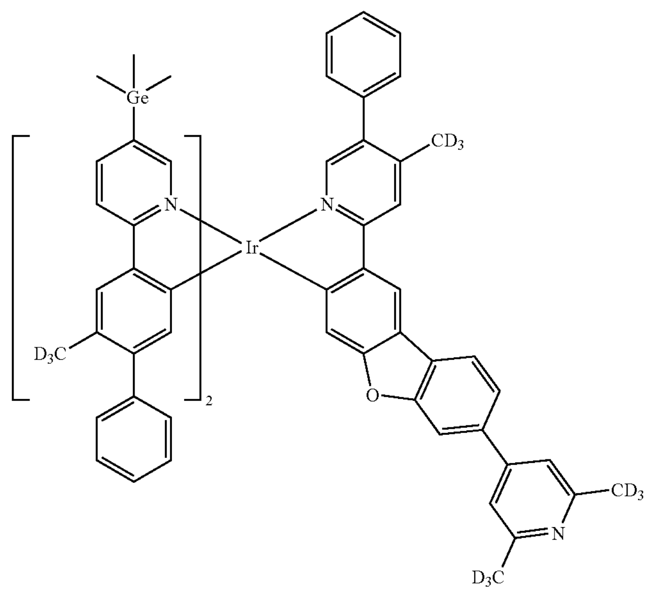
2799
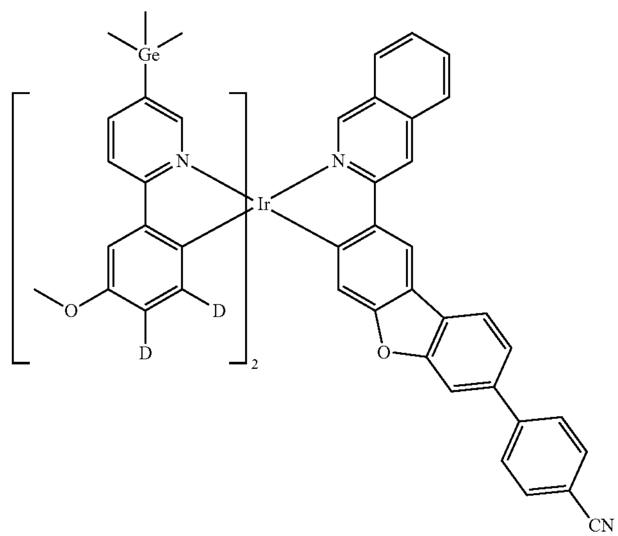
2800
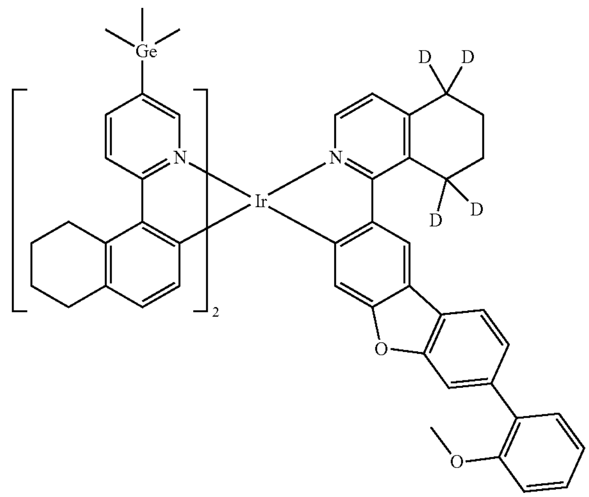

-continued
2801
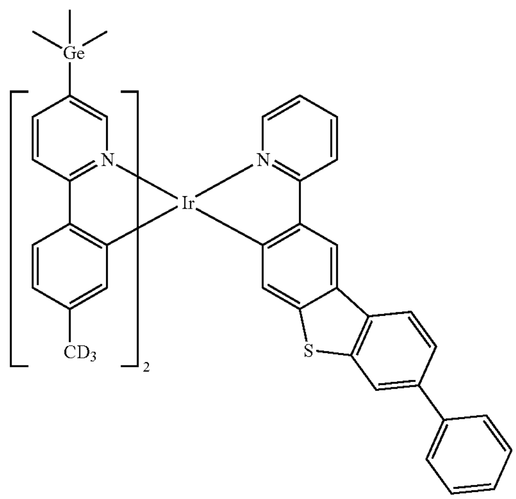
2802
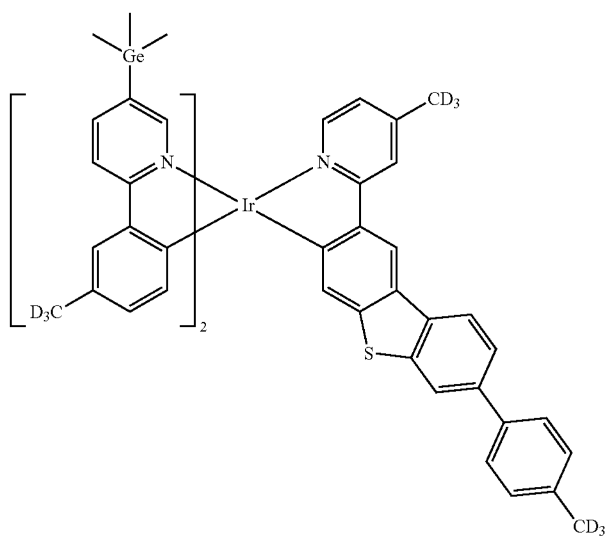
2803
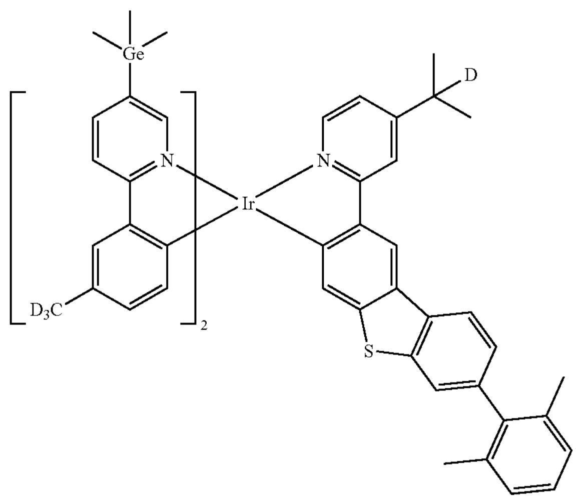

-continued
2804
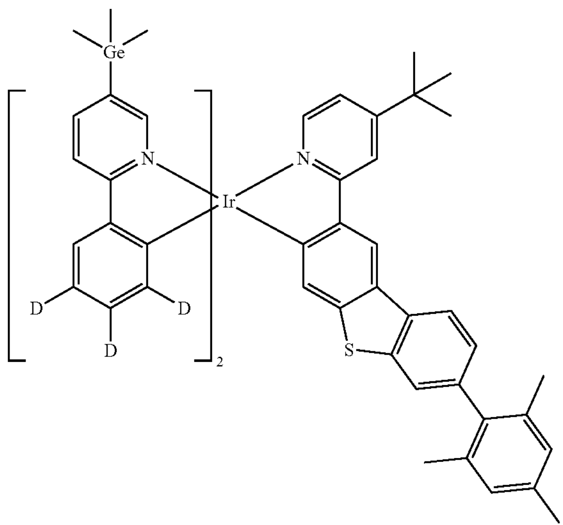
2805
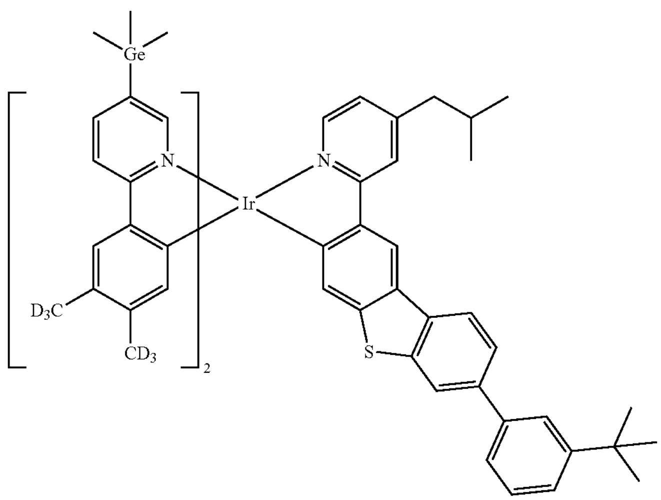
2806
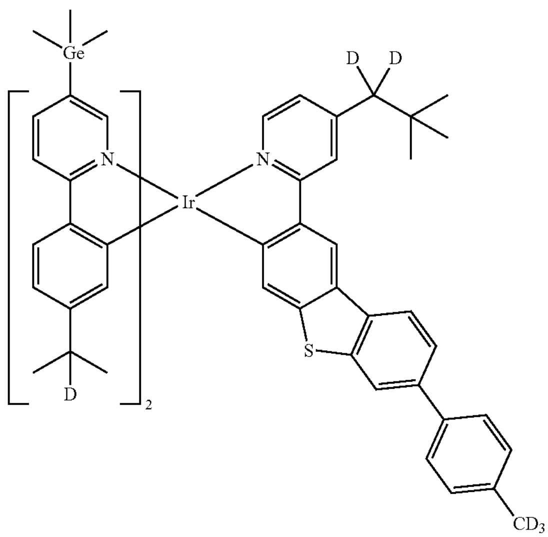

-continued
2807
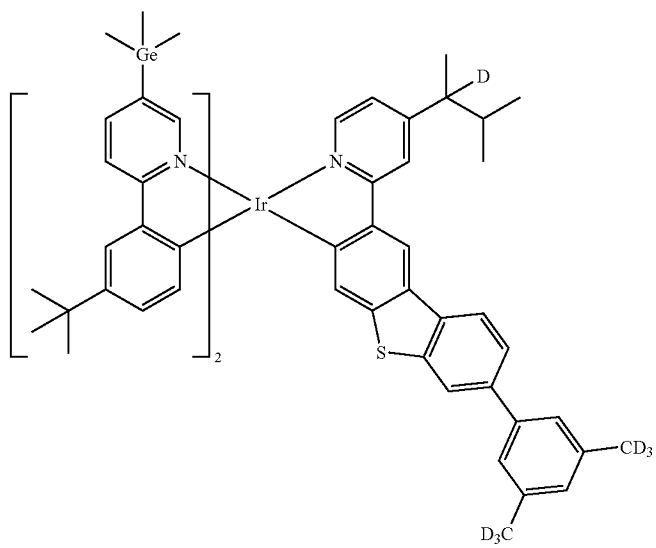
2808
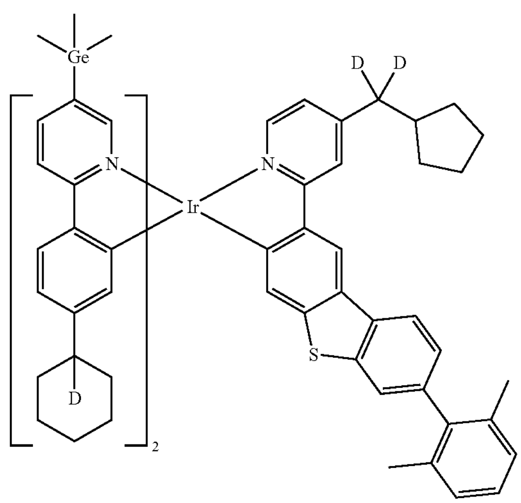

-continued
2809
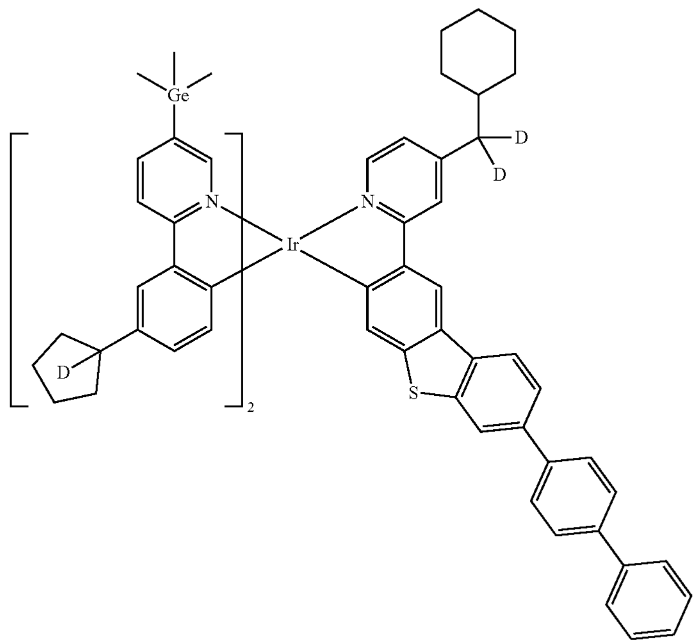
Group 1-7
1
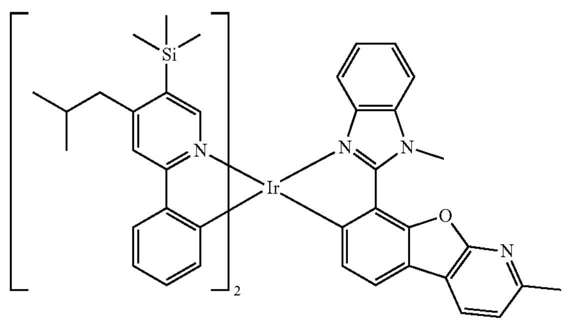
2
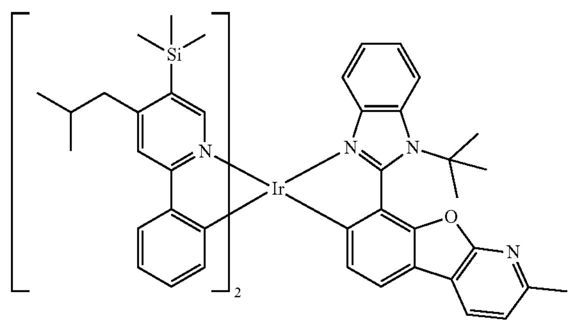
3
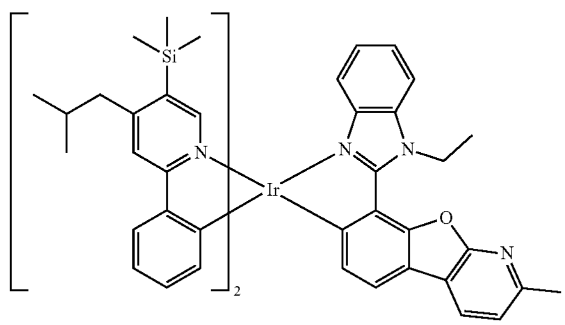
4
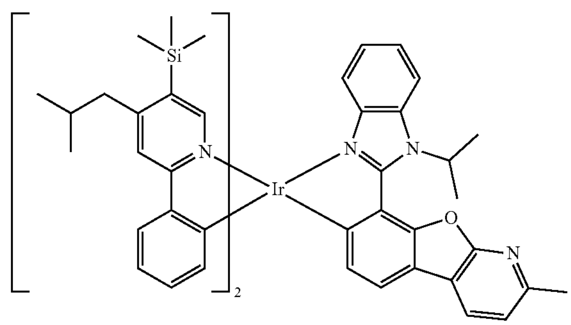

-continued
5
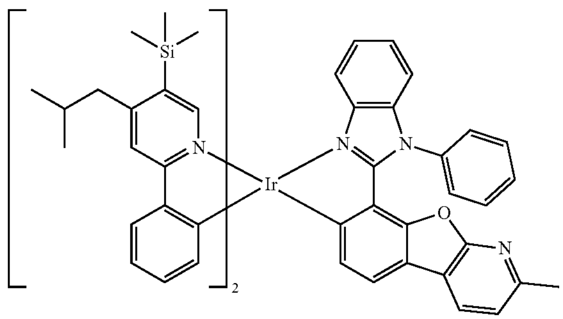
6
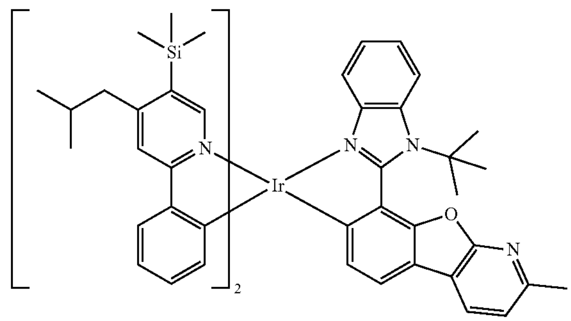
7
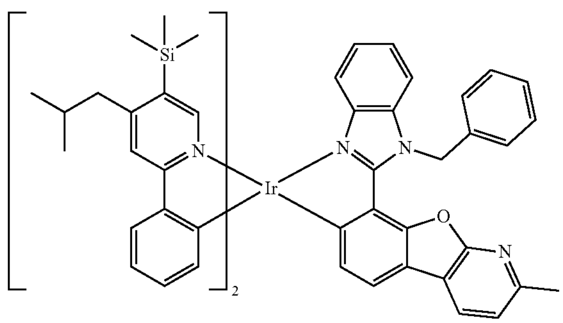
8
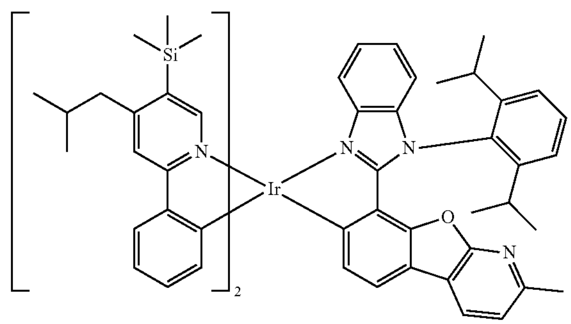
9
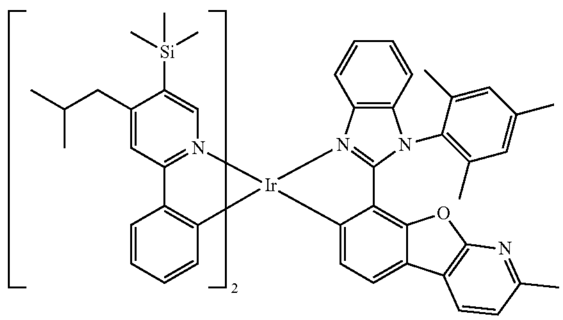
10
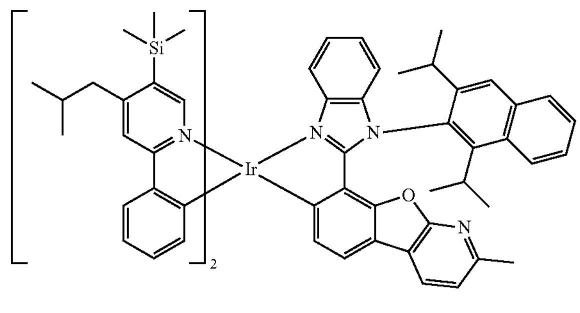
11
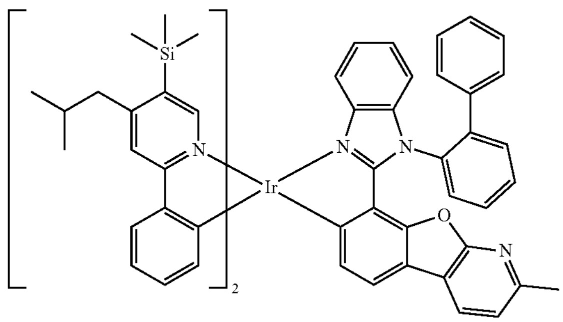
12
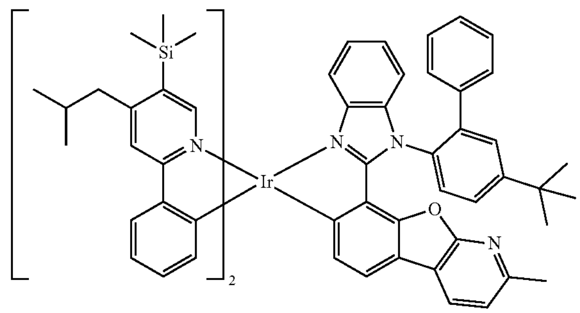

-continued
13
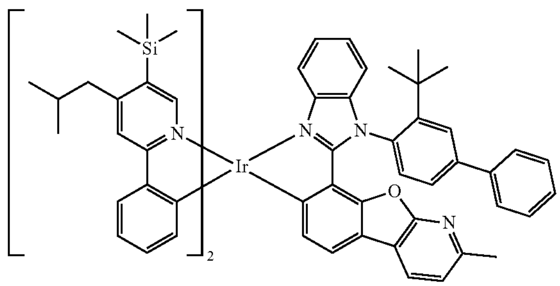
14
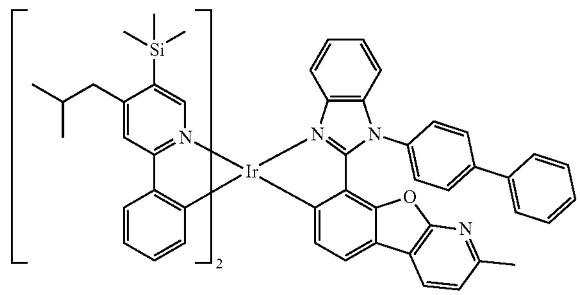
15
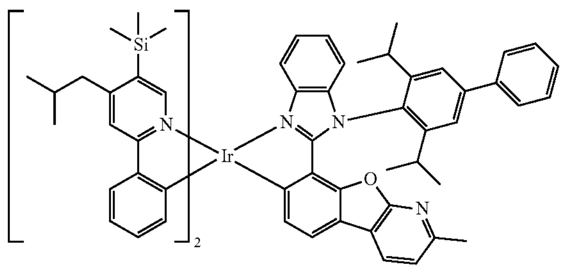
16
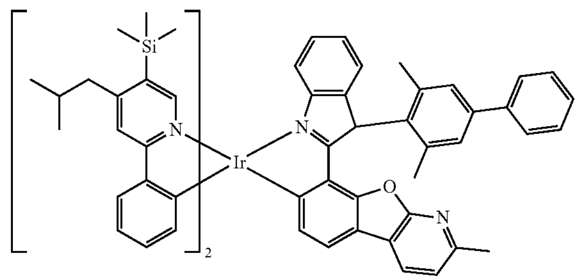
17
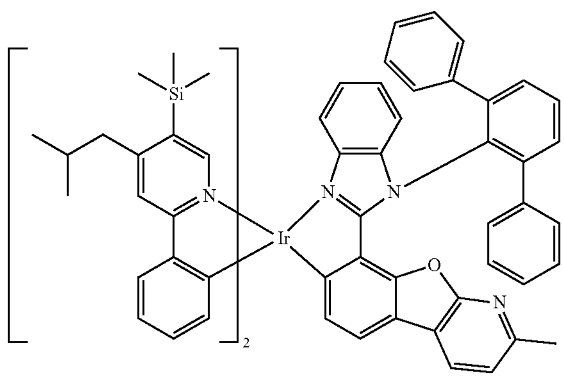
18
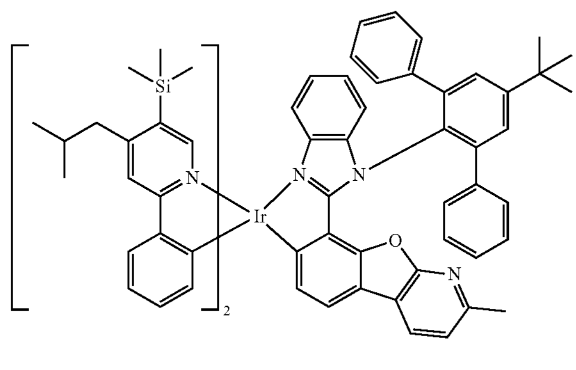
19
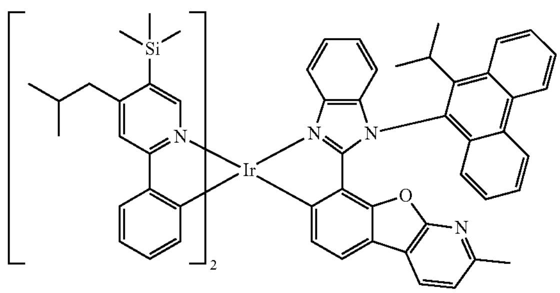

-continued
20
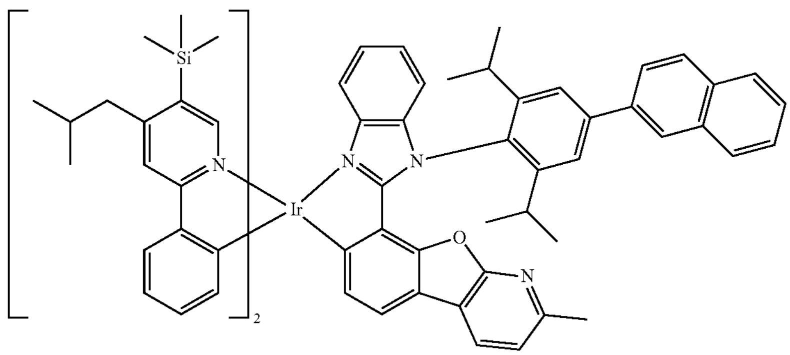
21
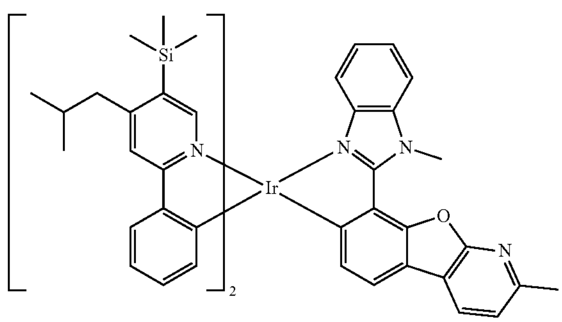
22
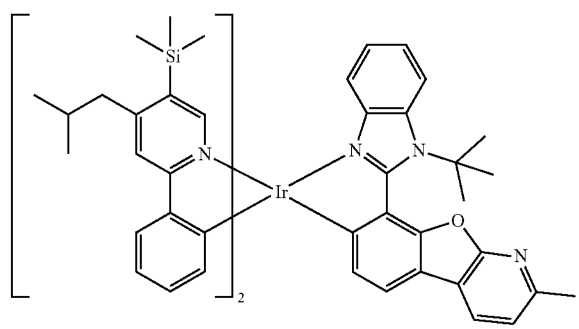
23
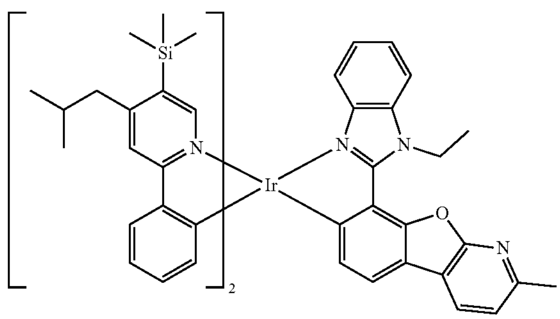
24
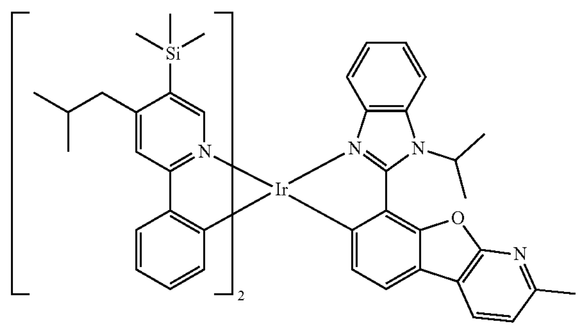
25
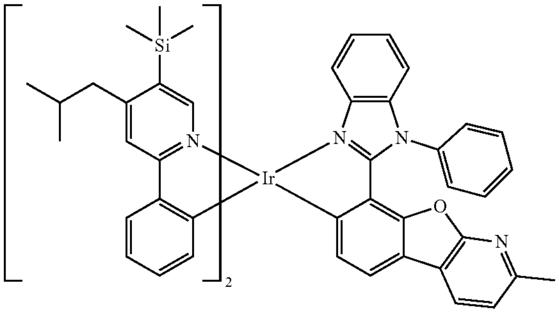
26
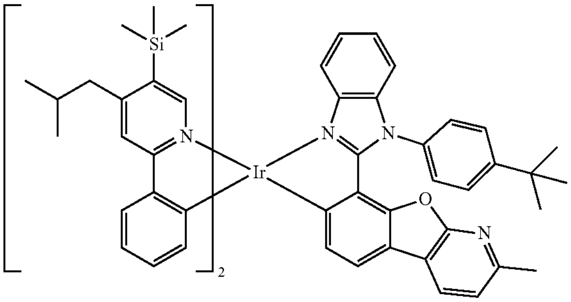

-continued
27
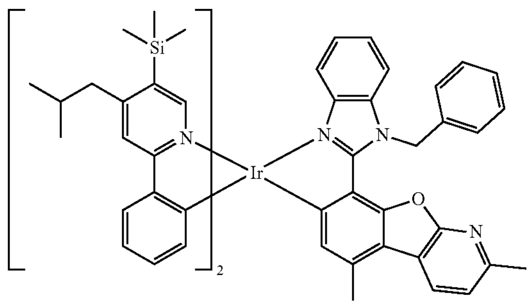
28
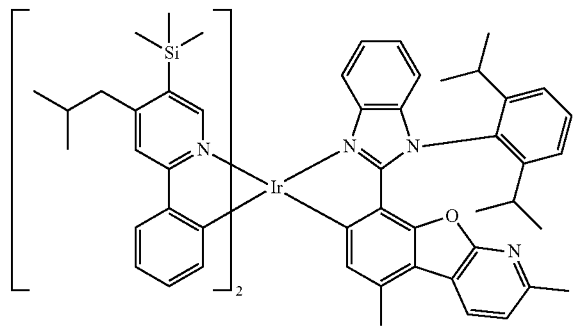
29
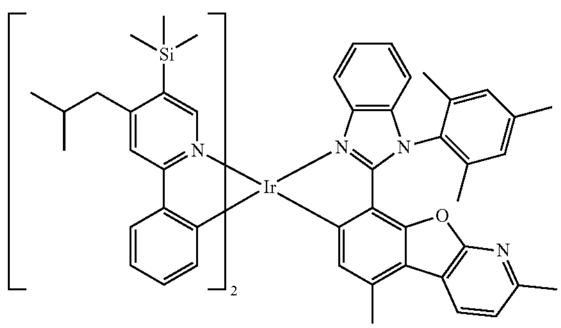
30
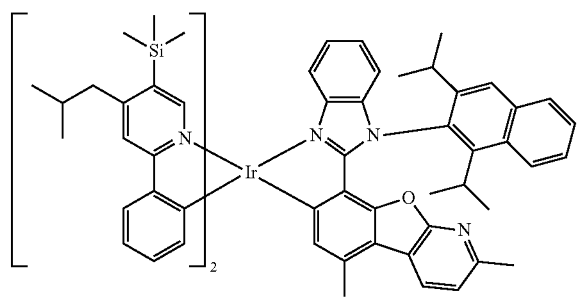
31
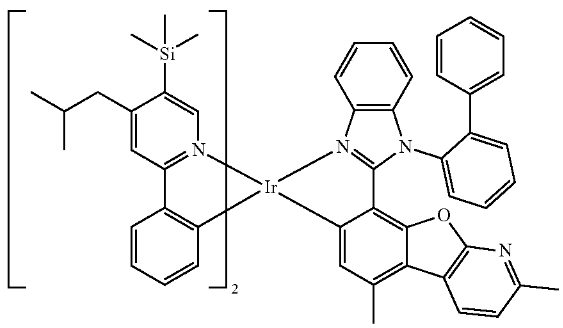
32
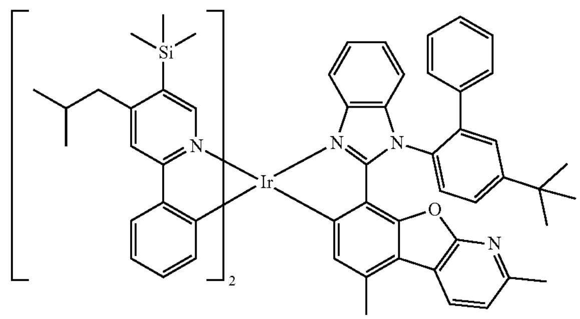
33
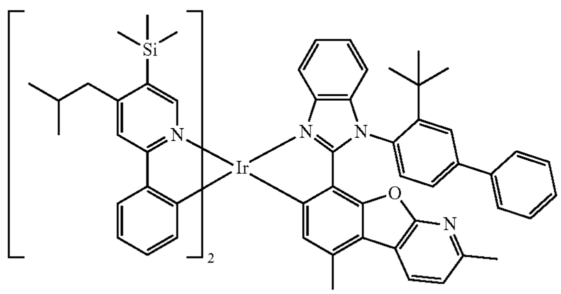
34
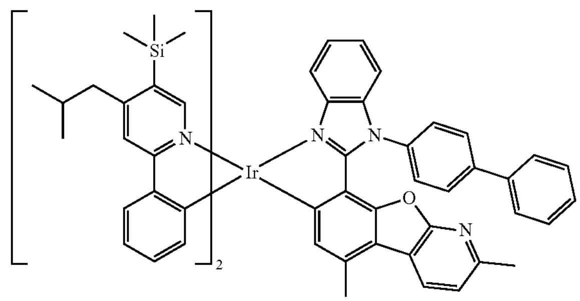

-continued
35
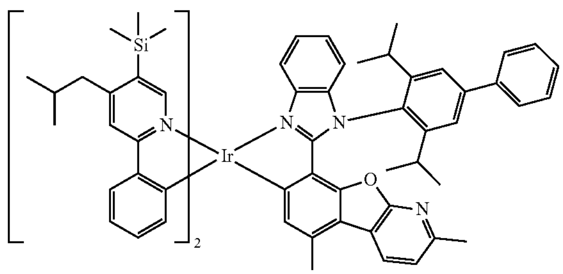
36
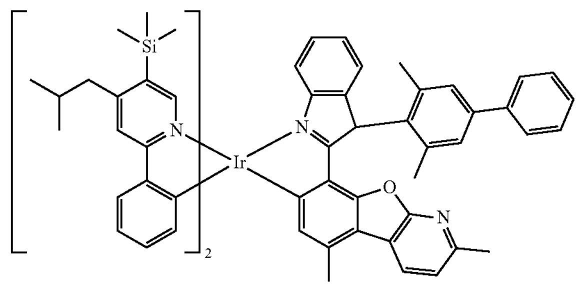
37
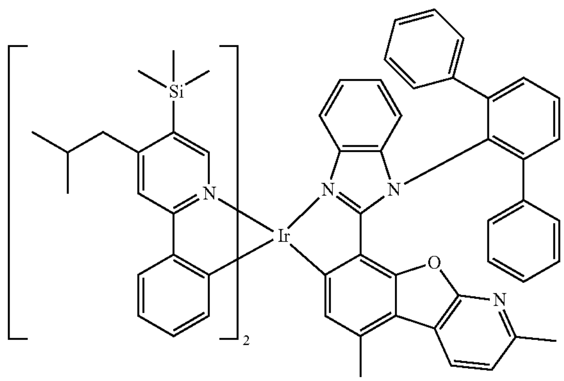
38
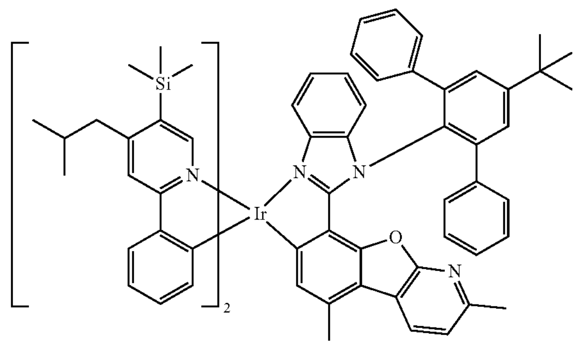
39
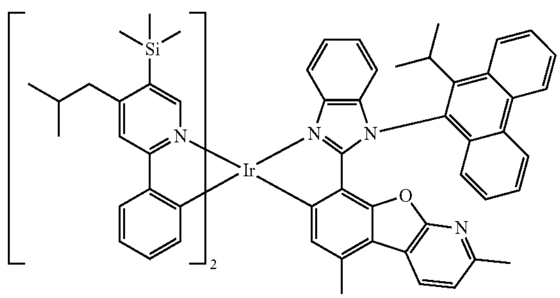
40
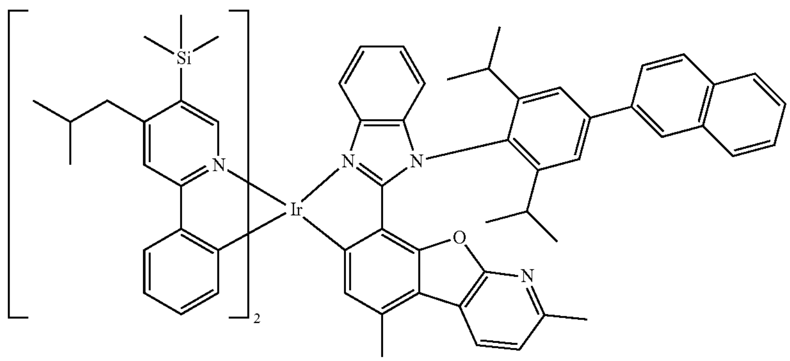

-continued
41
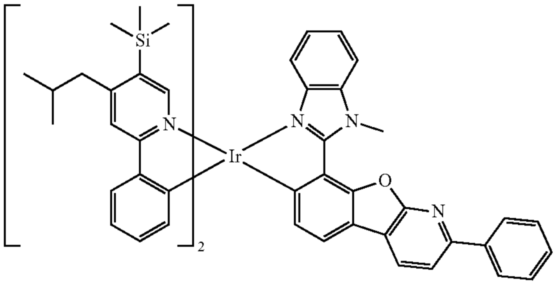
42
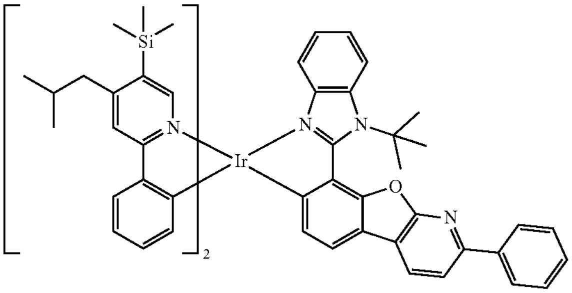
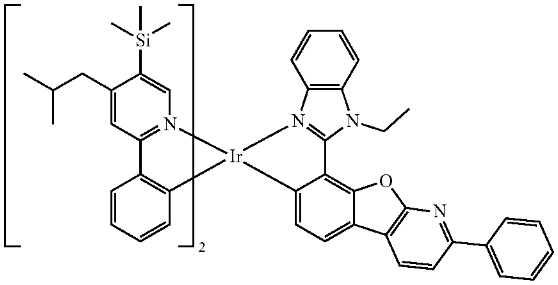
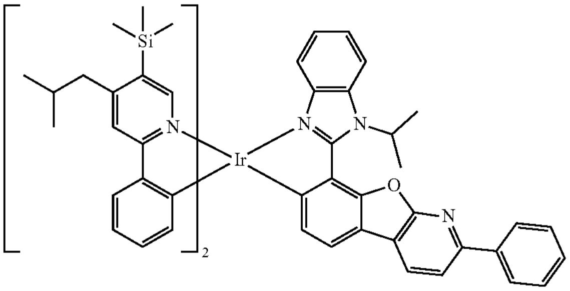
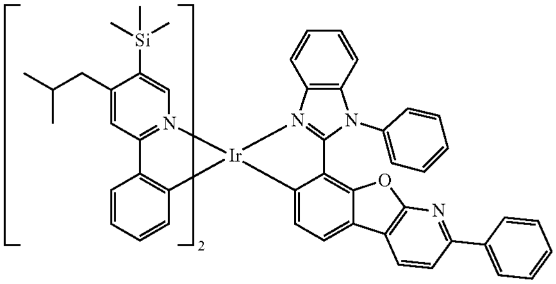
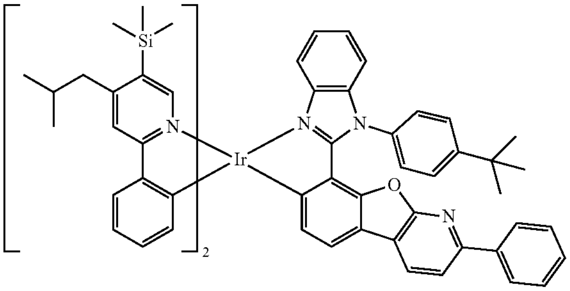
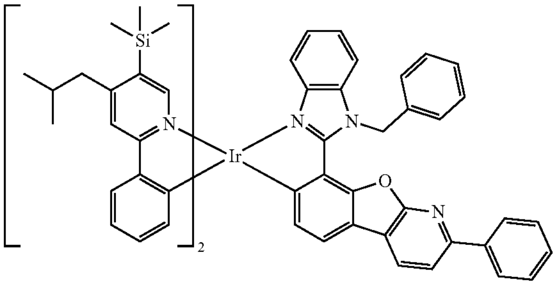
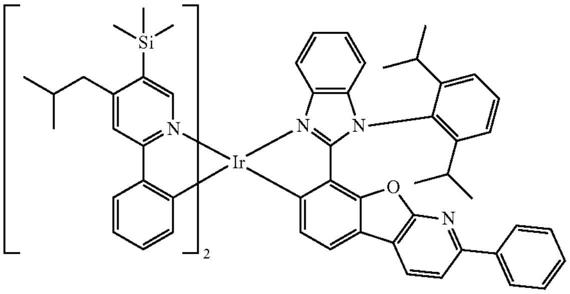
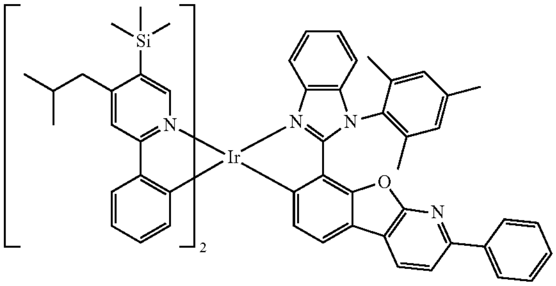
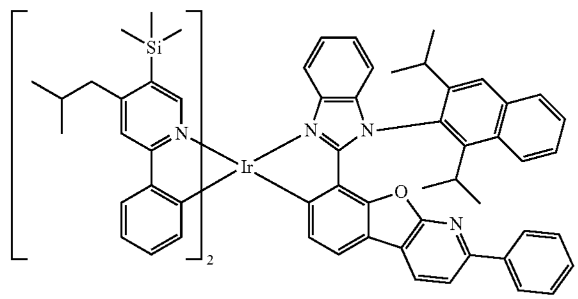

-continued
51
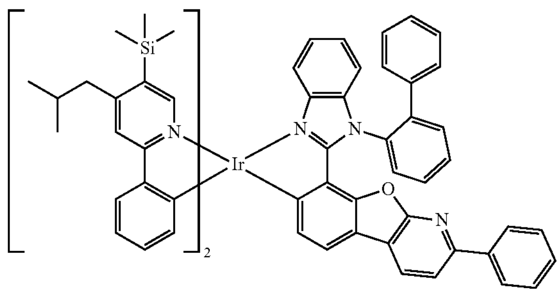
52
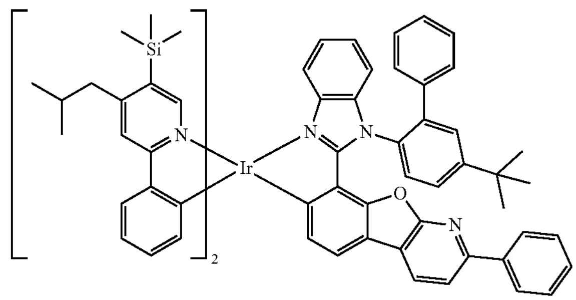
53
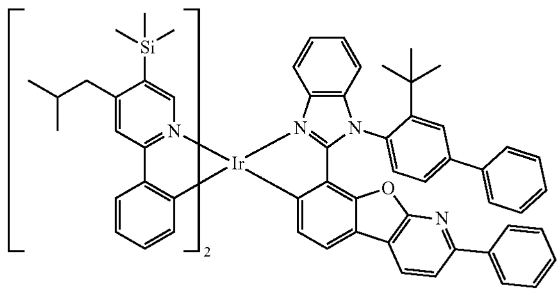
54
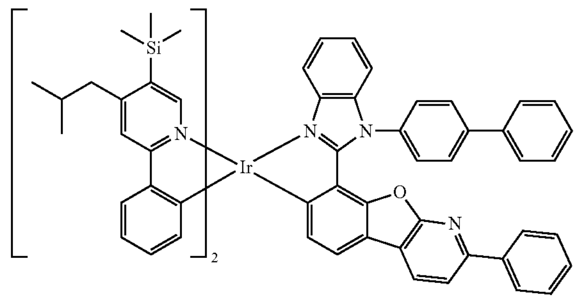
55
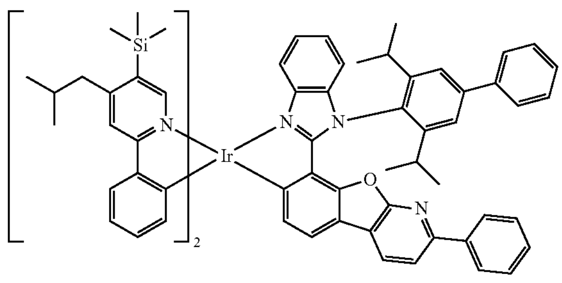
56
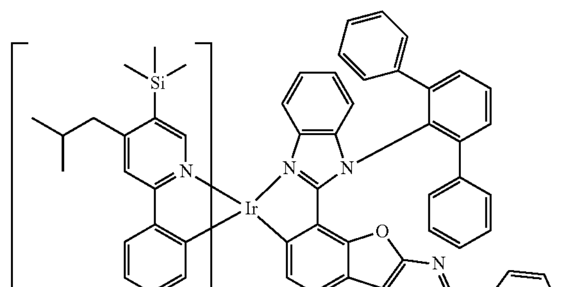
57
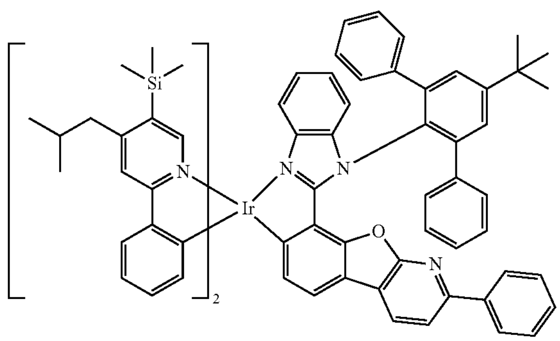
58
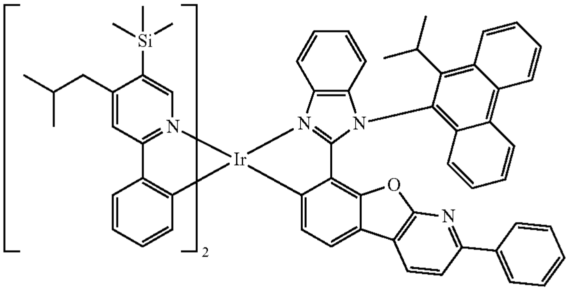
59
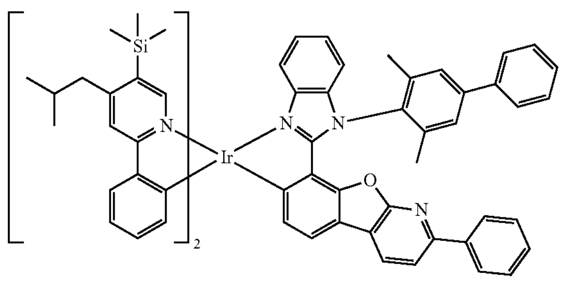

-continued
60
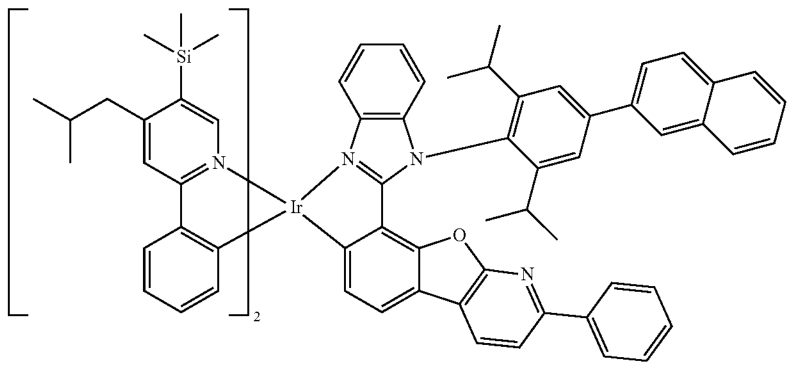
61
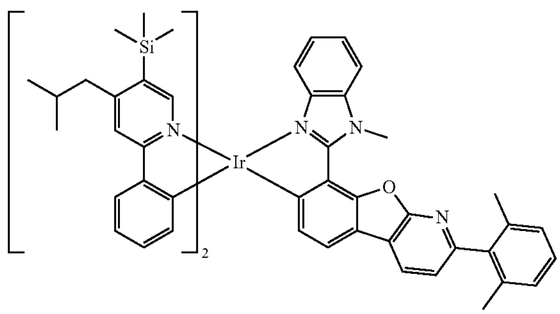
62
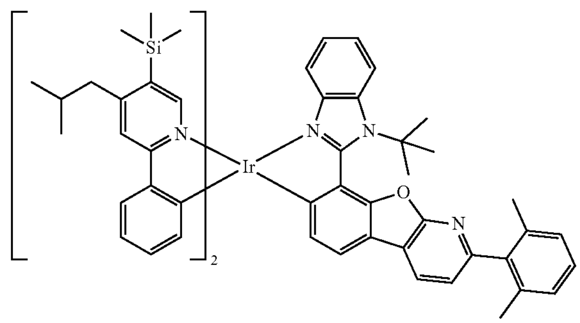
63
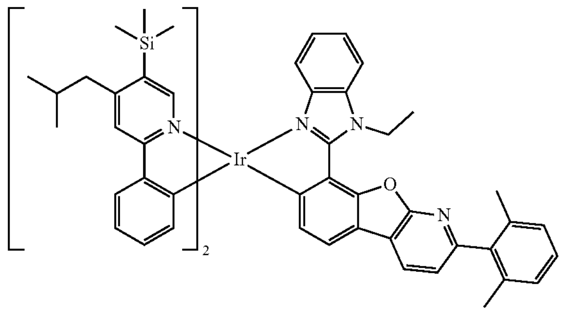
64
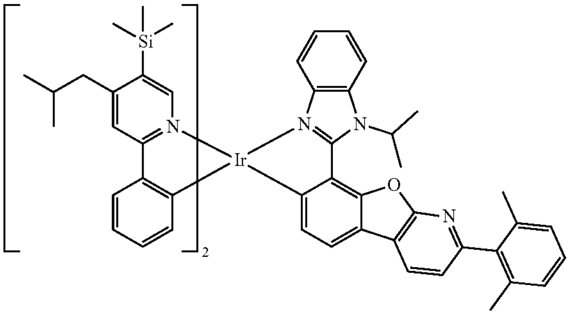
65
66
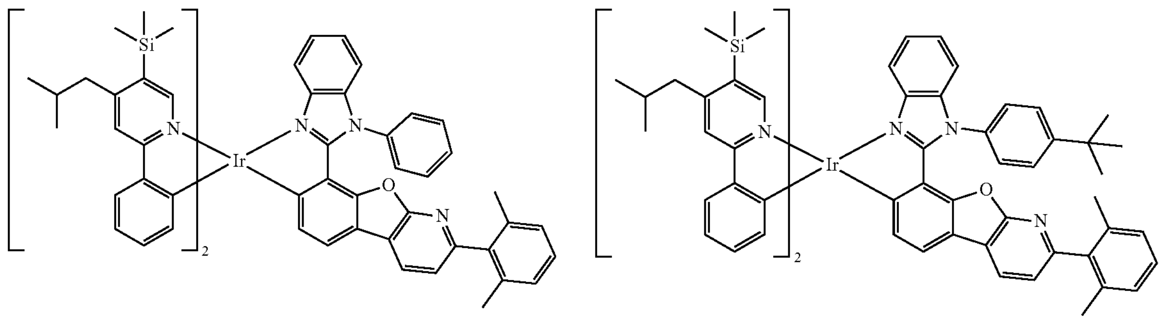

-continued
67
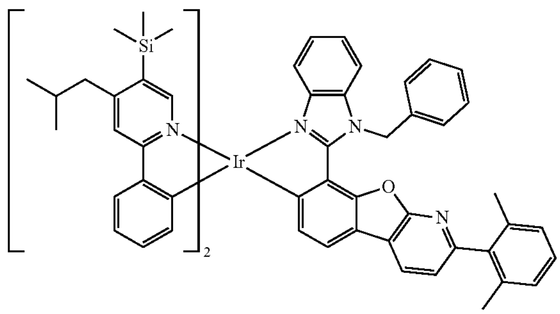
68
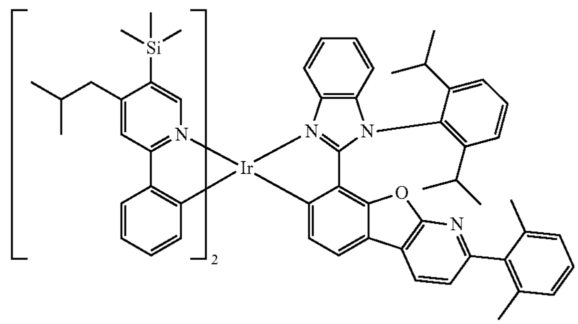
69
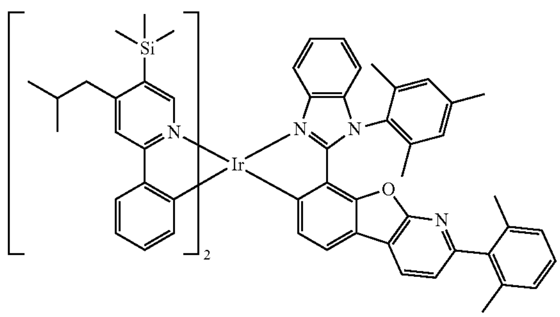
70
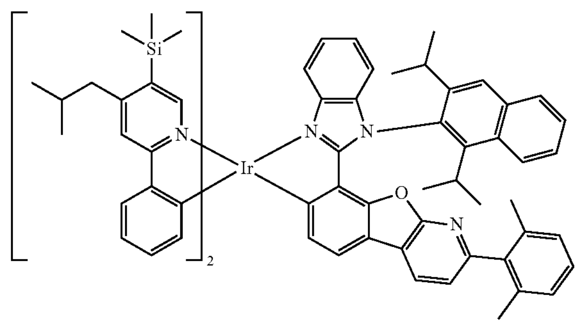
71
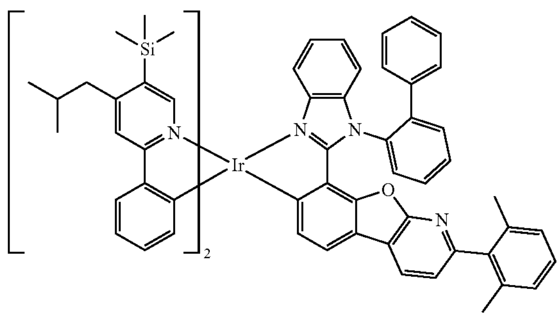
72
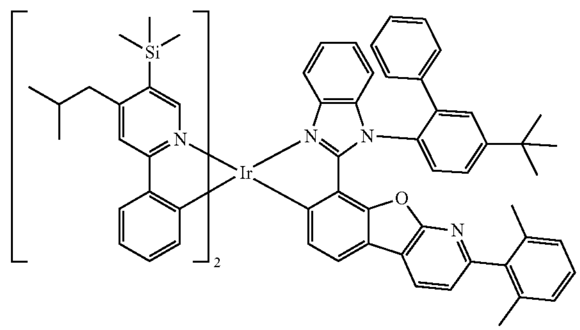
73
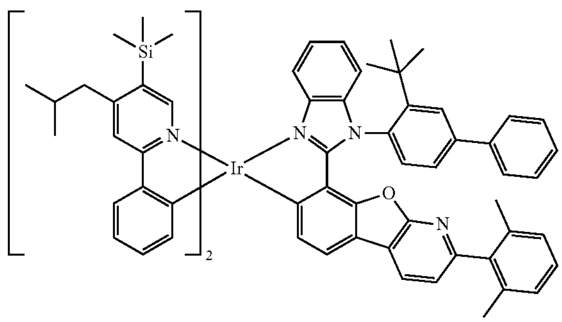
74
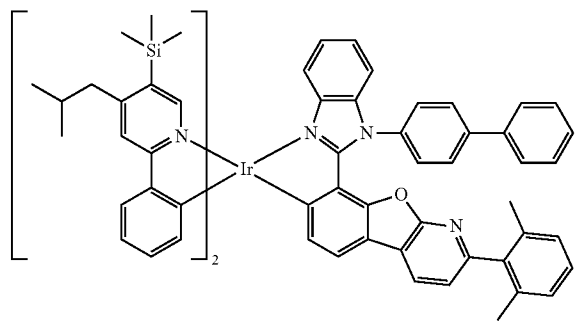

-continued
75
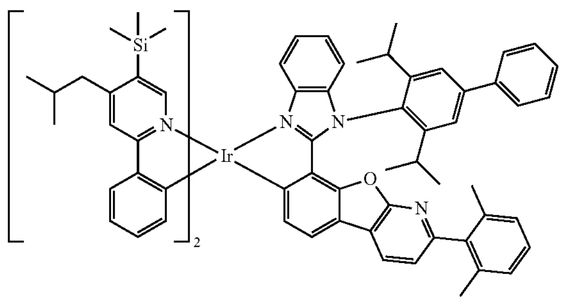
76
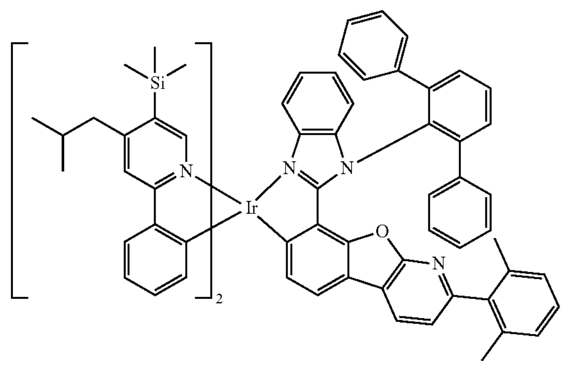
77
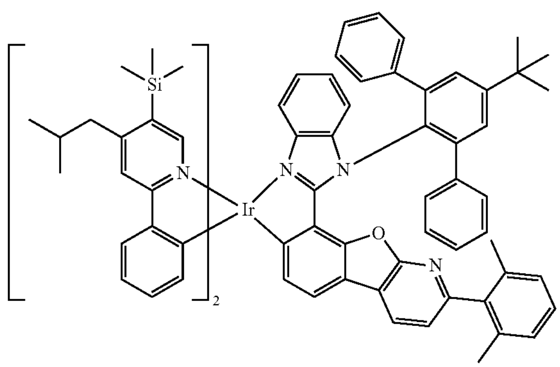
78
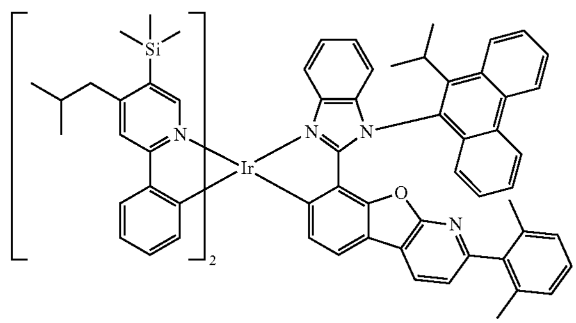
79
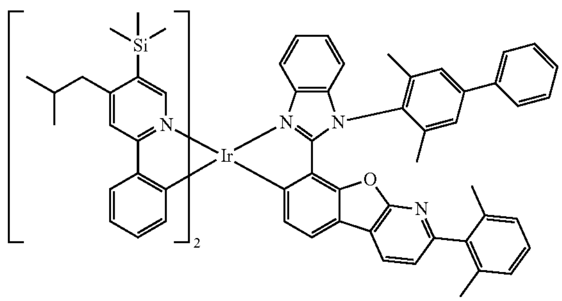
80
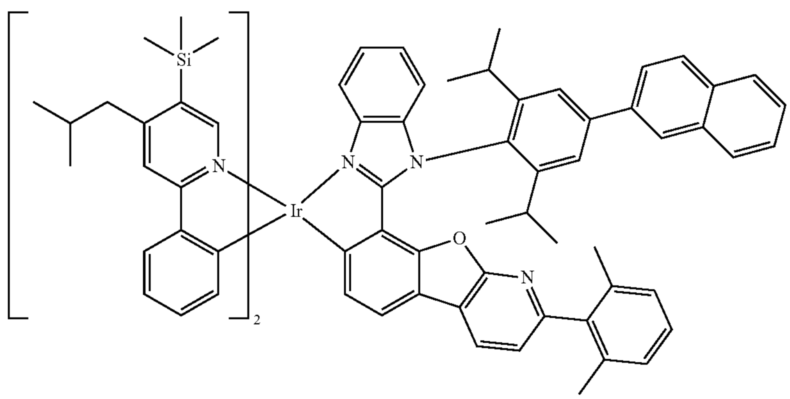

-continued
81
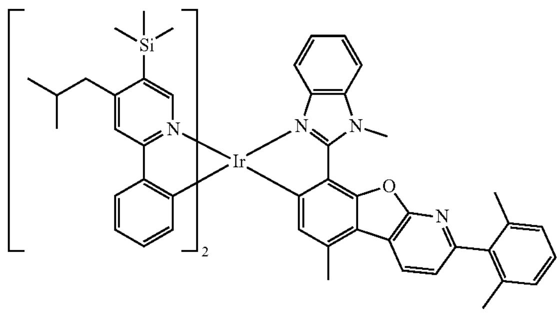
82
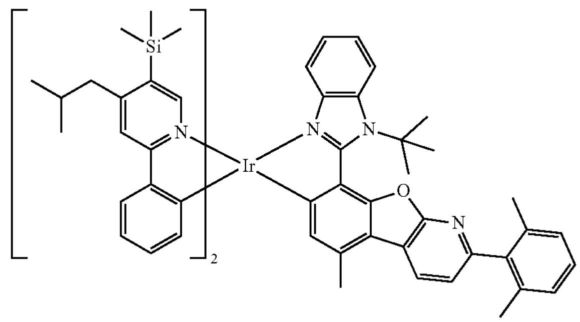
83
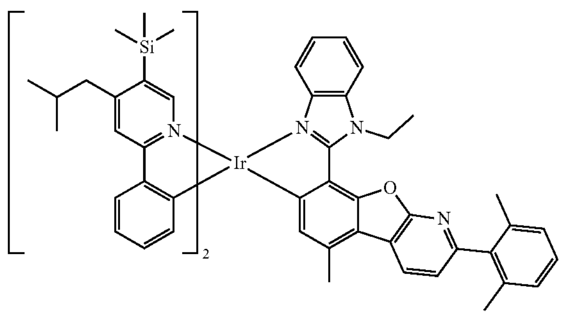
84
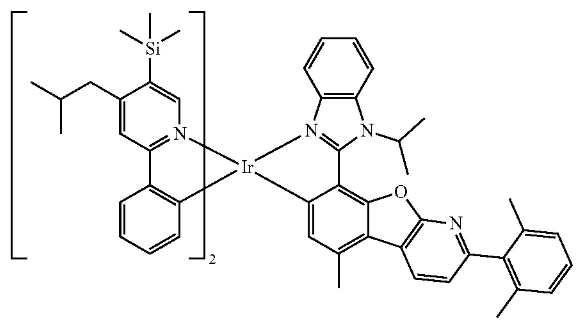
85
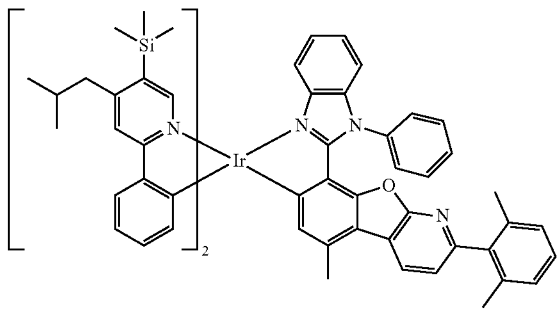
86
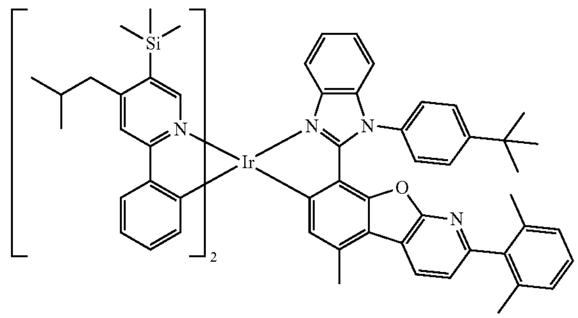
87
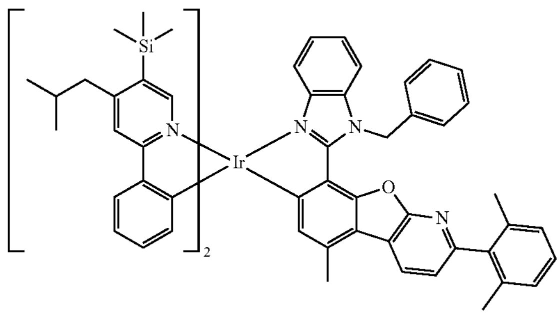
88
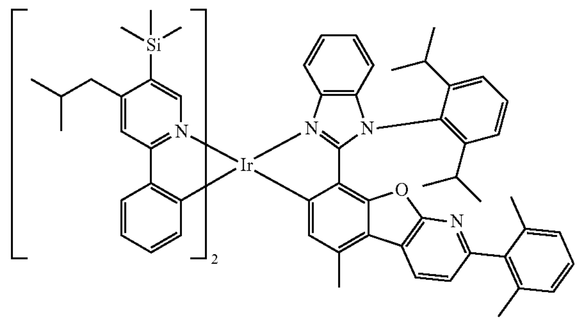

-continued
89
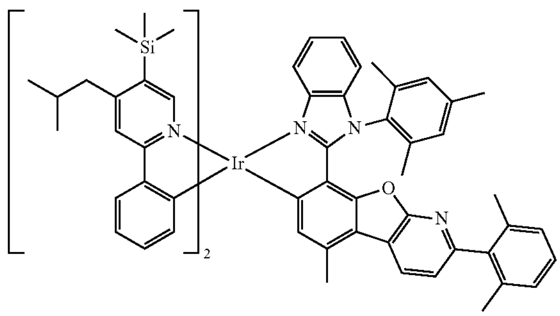
90
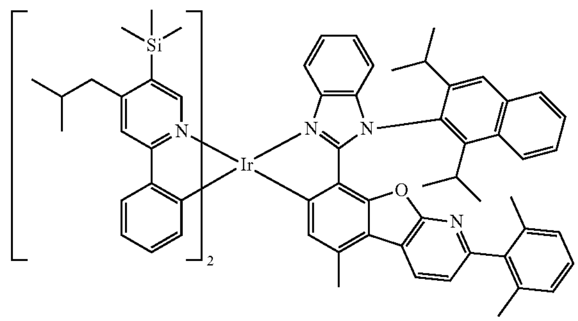
91
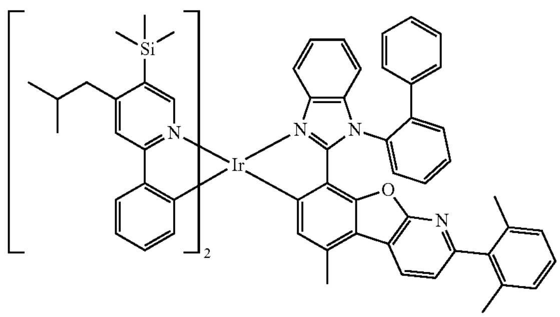
92
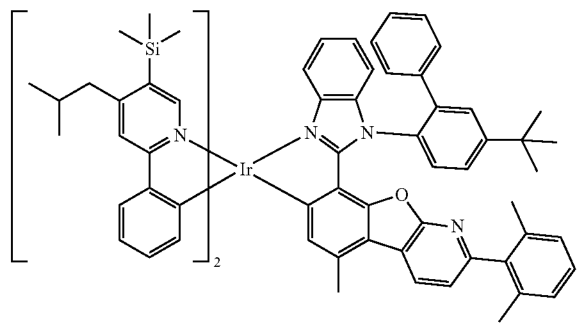
93
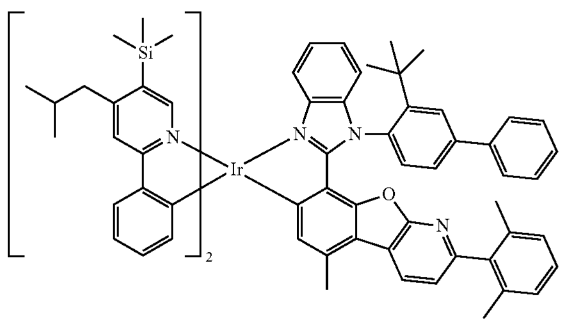
94
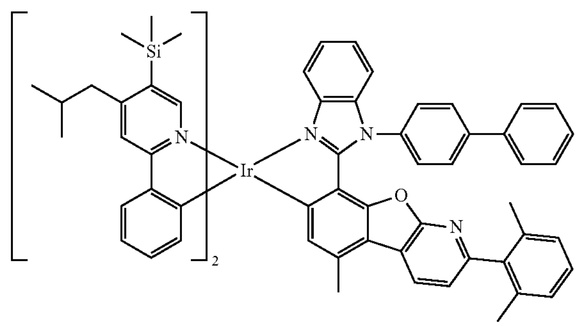
95
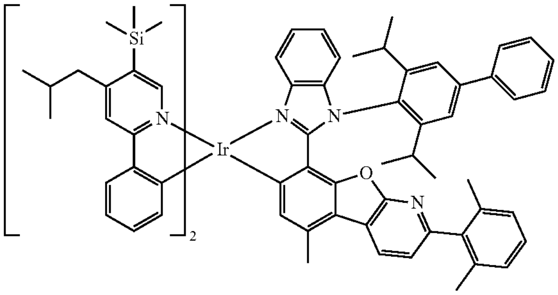
96
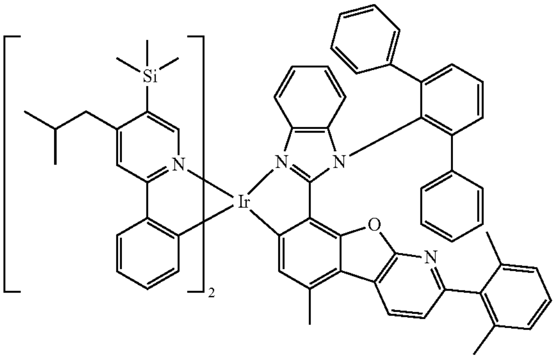

-continued
97
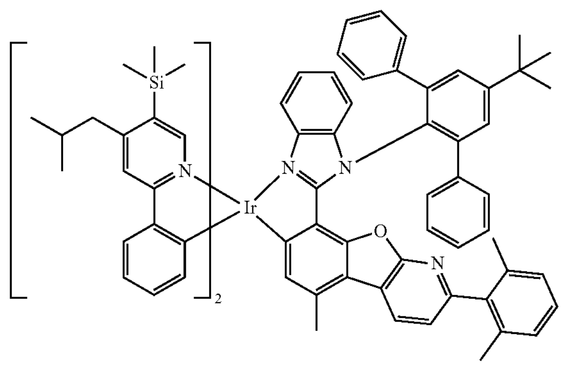
98
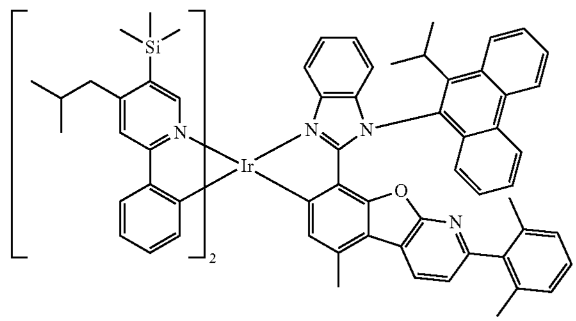
99
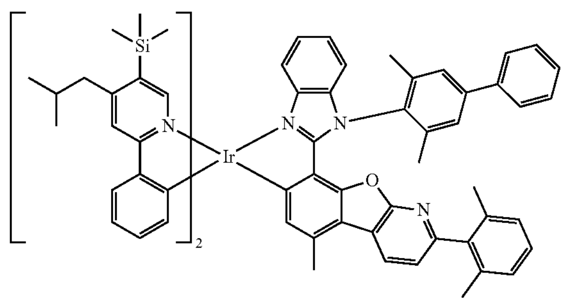
100
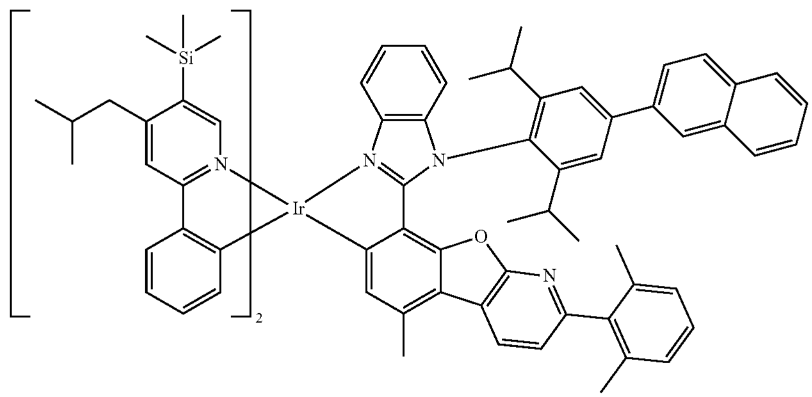
101
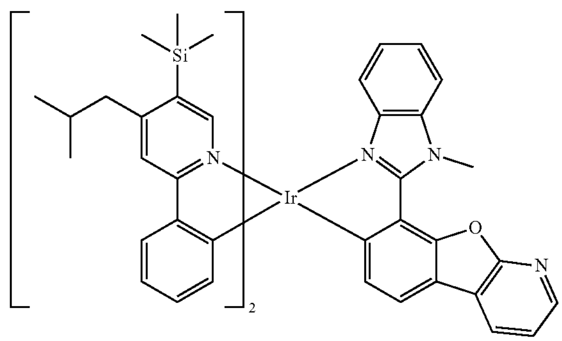
102
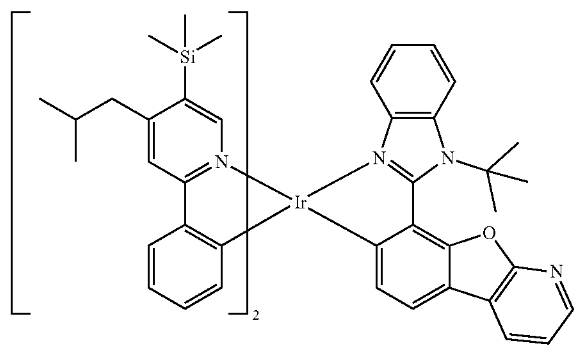

-continued
103
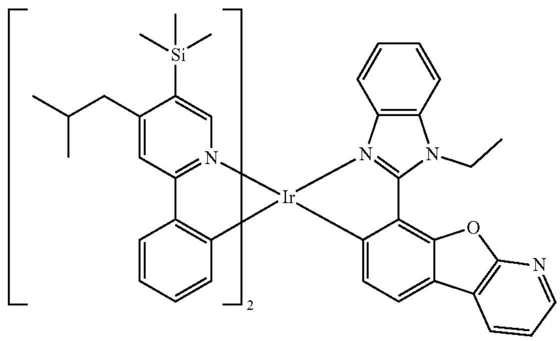
104
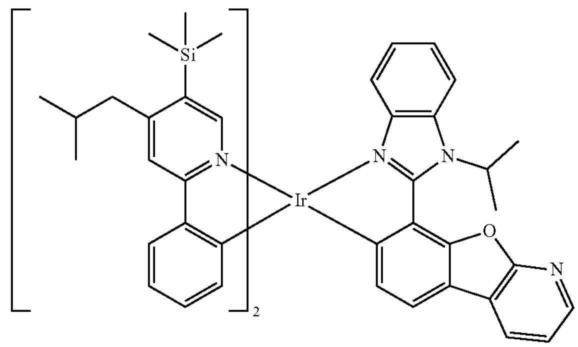
105
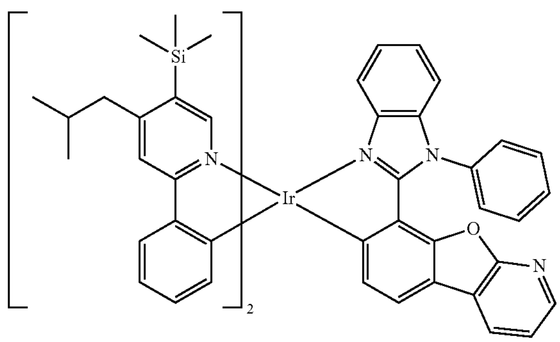
106
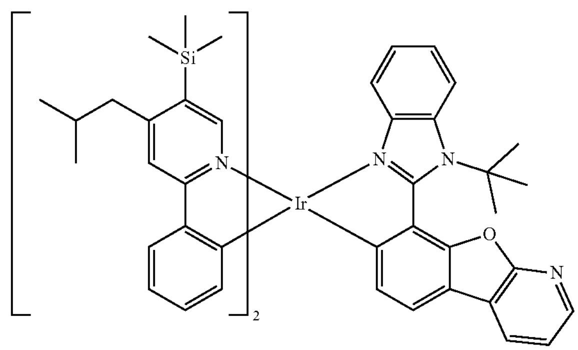
107
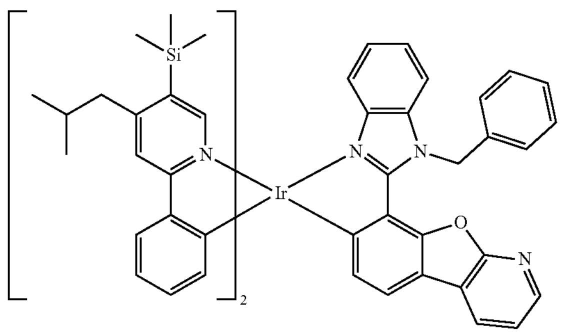
108
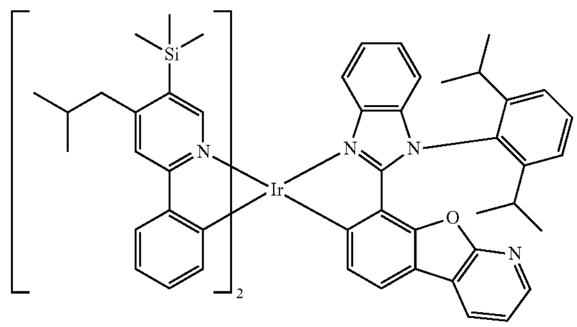
109
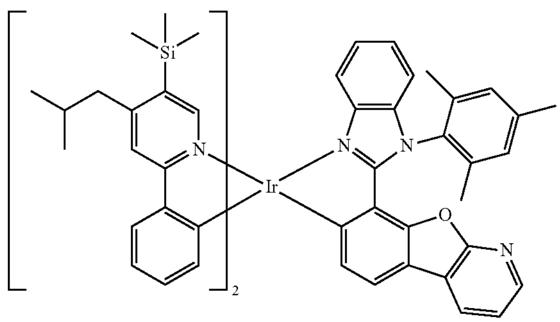
110
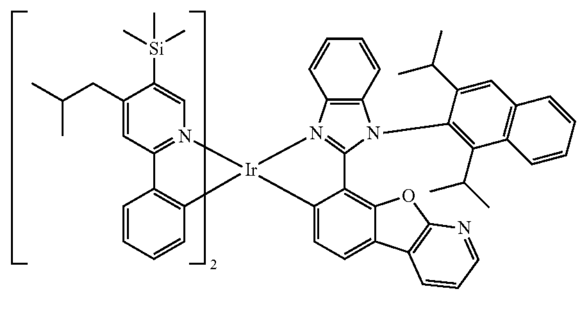

-continued
111
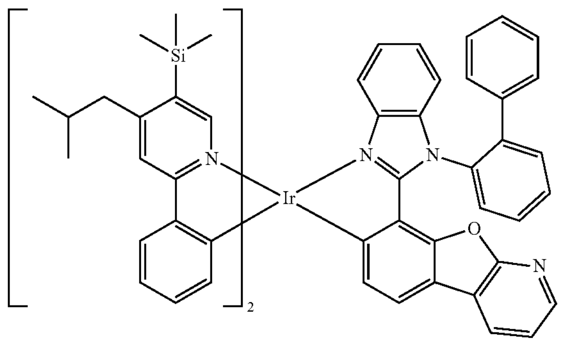
112
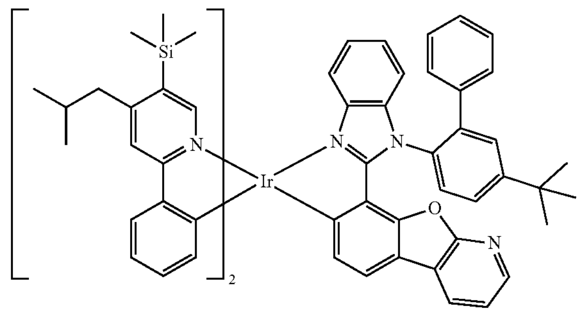
113
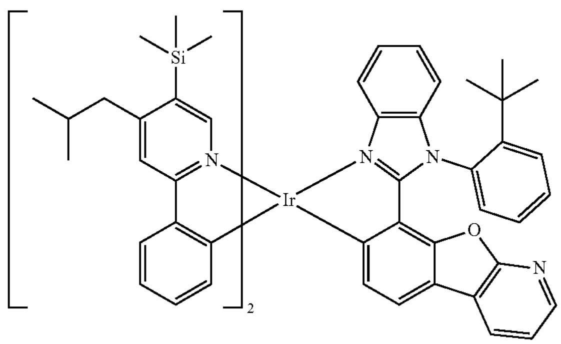
114
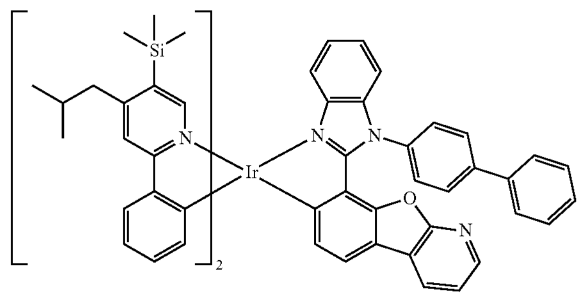
115
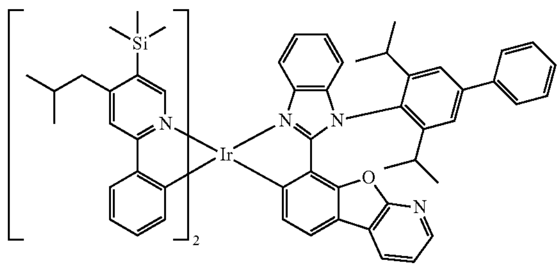
116
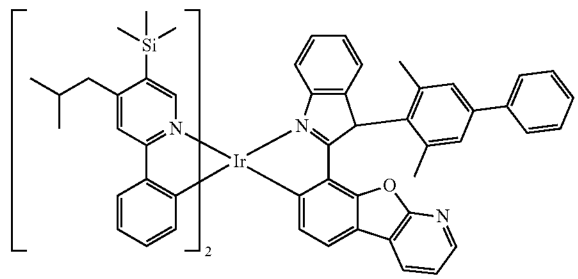
117
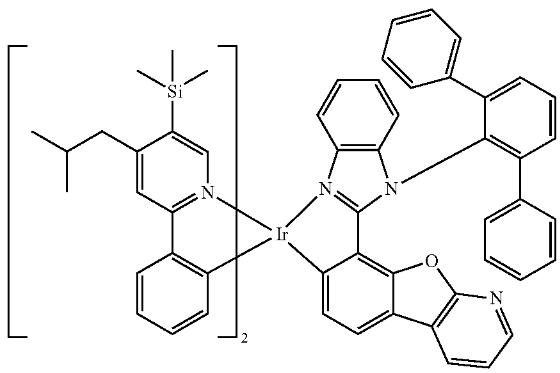
118
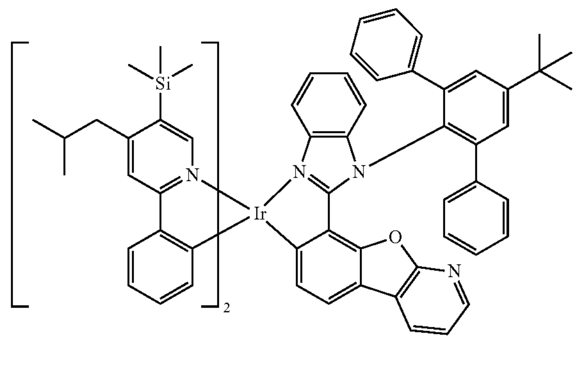

-continued
119
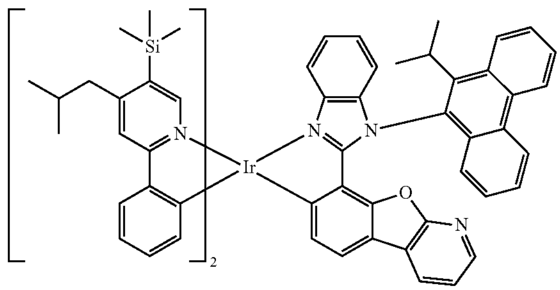
120
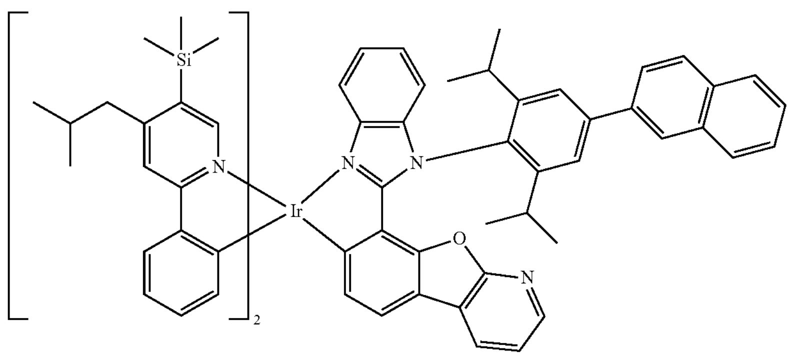
121
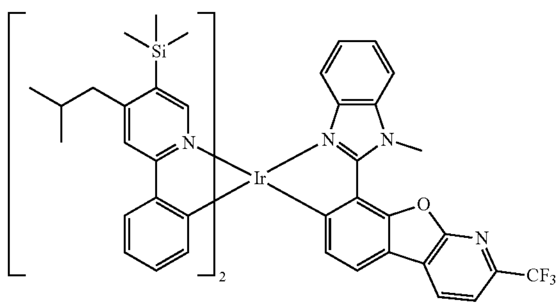
122
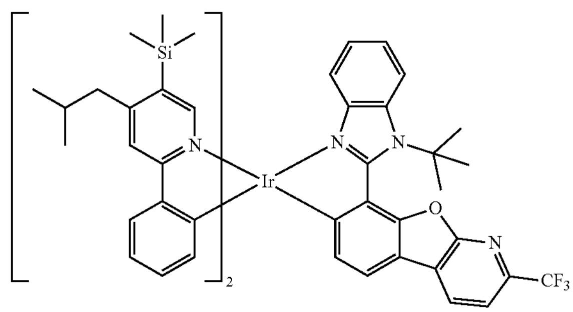
123
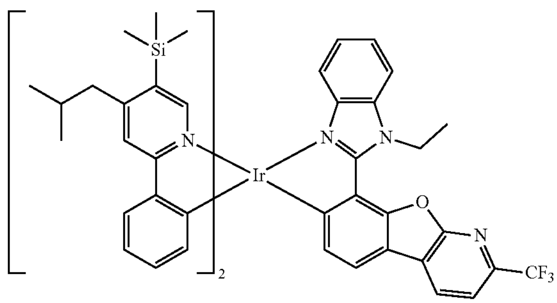
124
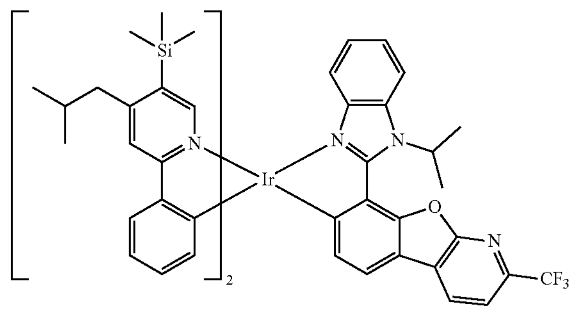
125
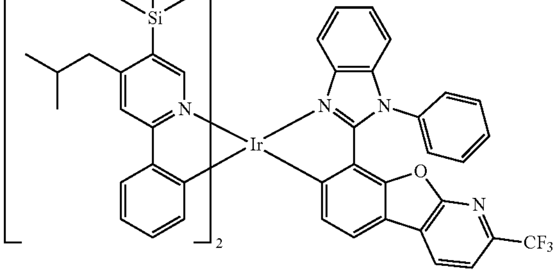
126
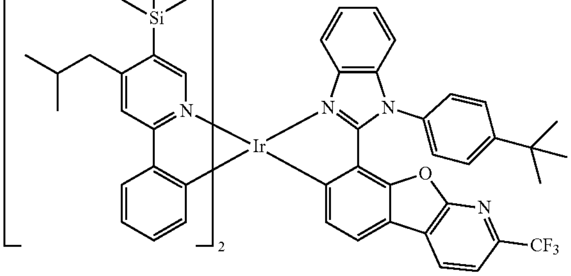

-continued
127
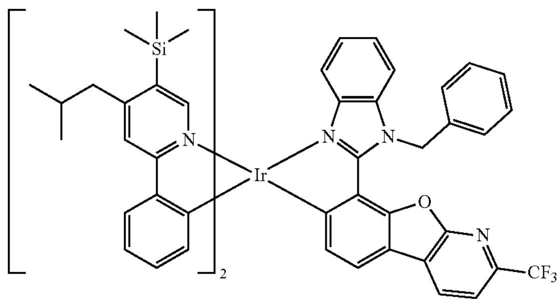
128
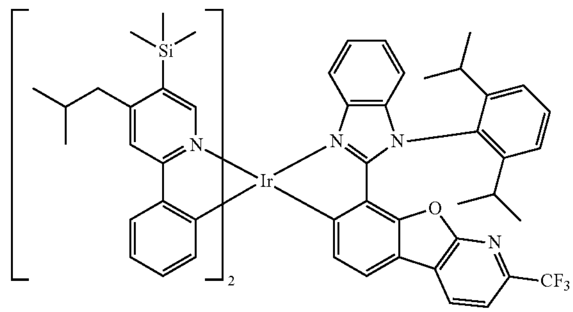
129
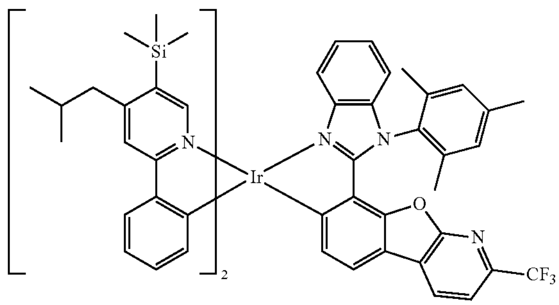
130
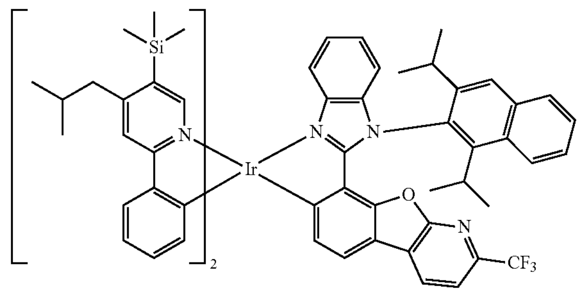
131
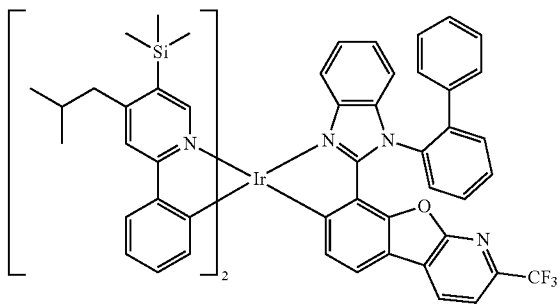
132
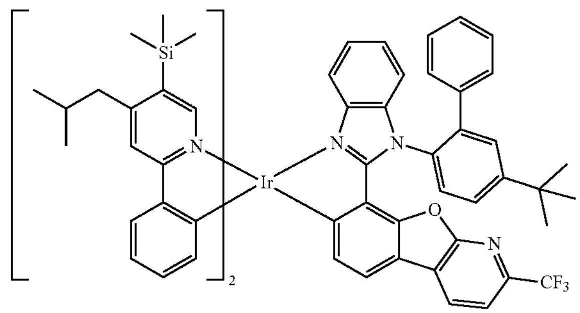
133
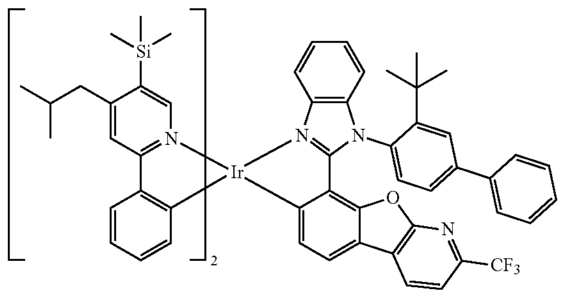
134
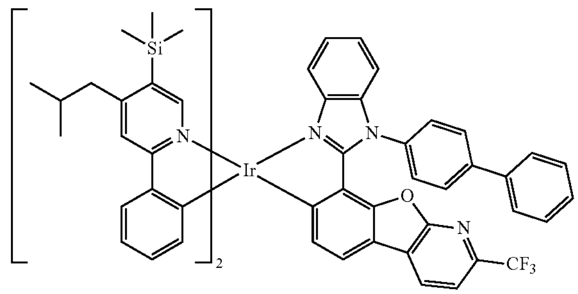
135
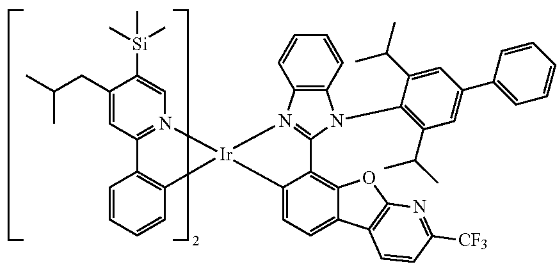
136
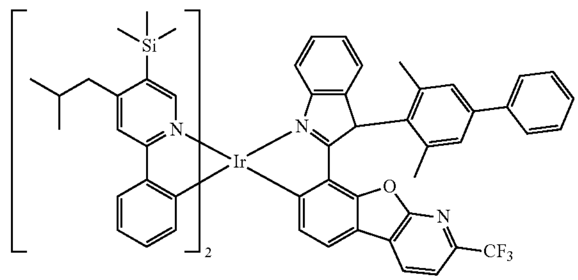

-continued
137
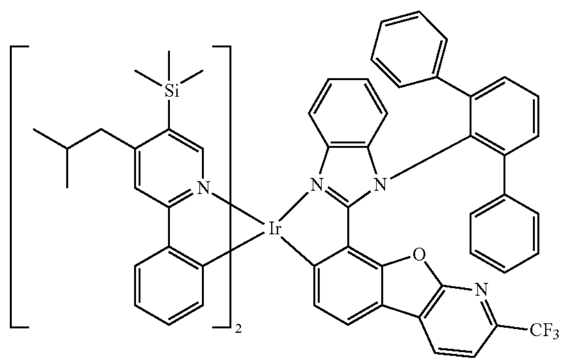
138
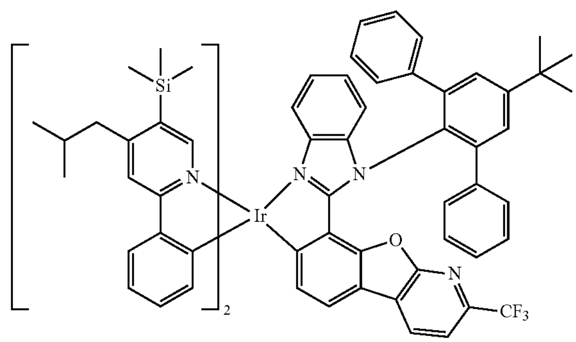
139
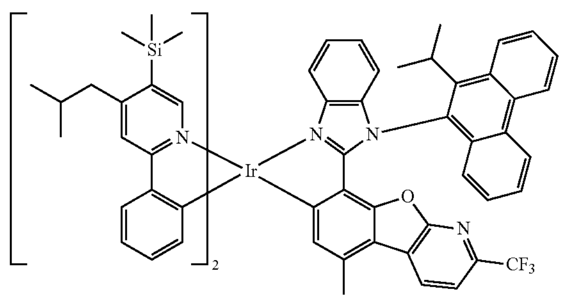
140
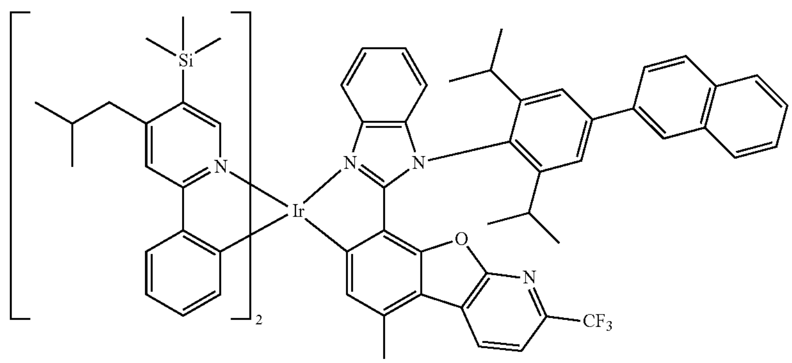
141
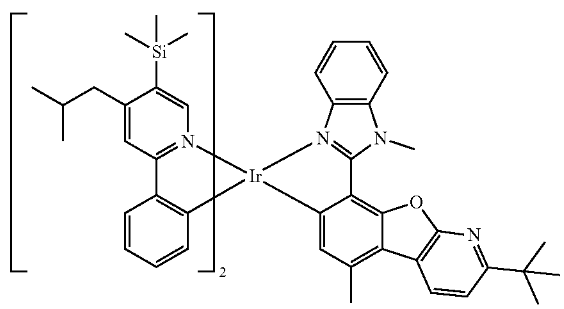
142
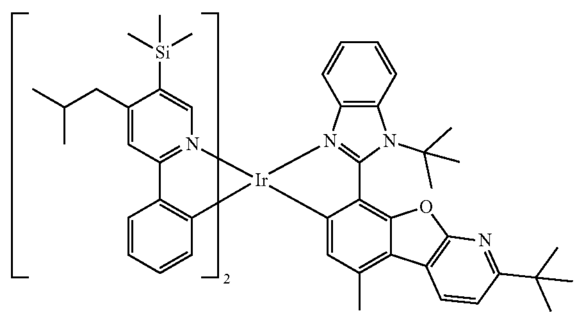

-continued
143
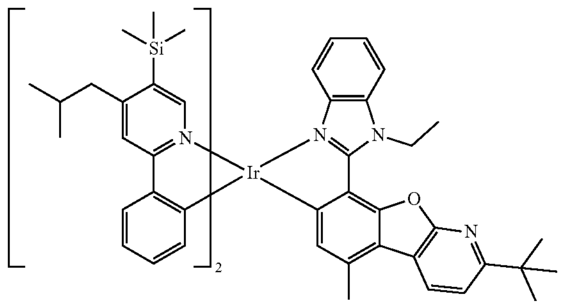
144
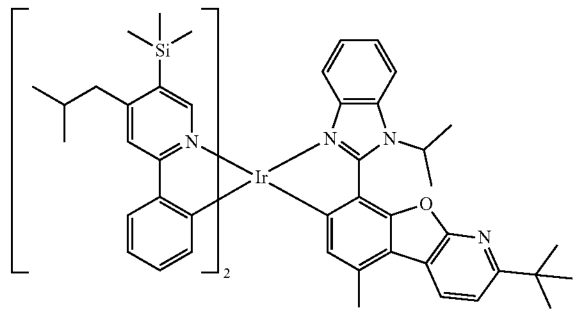
145
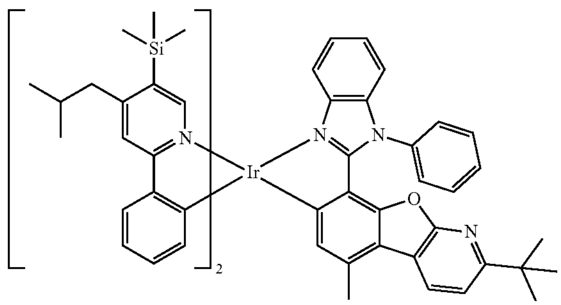
146
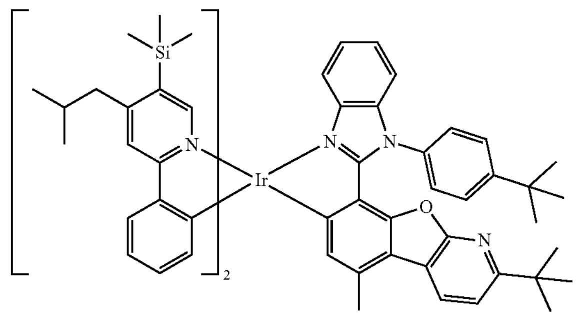
147
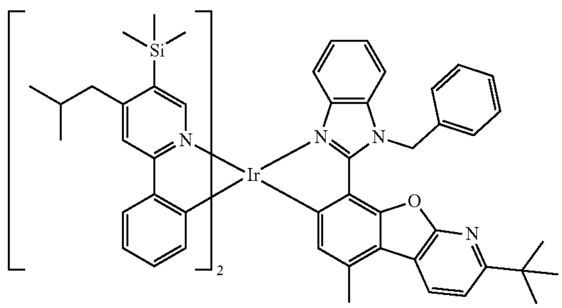
148
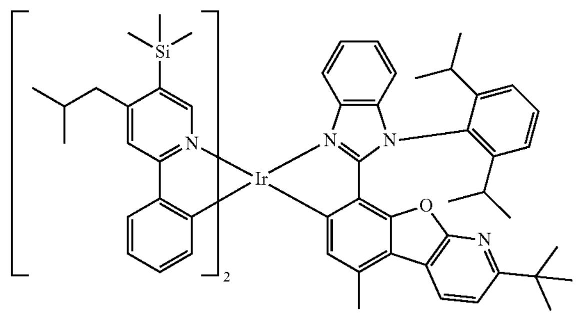
149
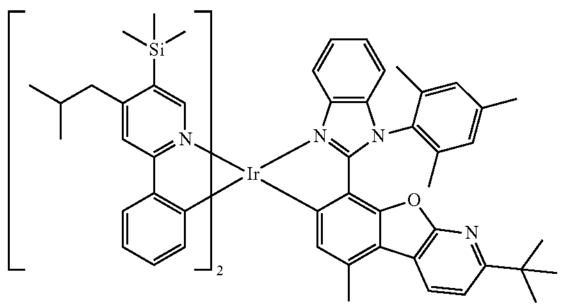
150
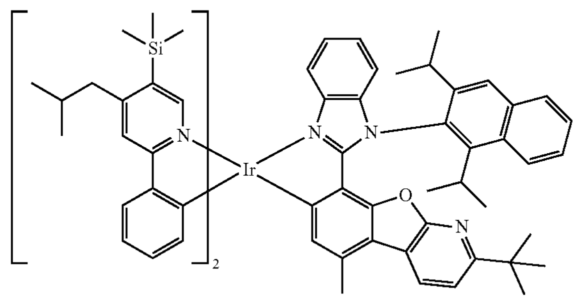

-continued
151
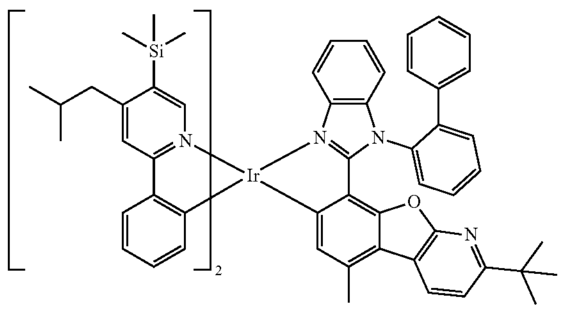
152
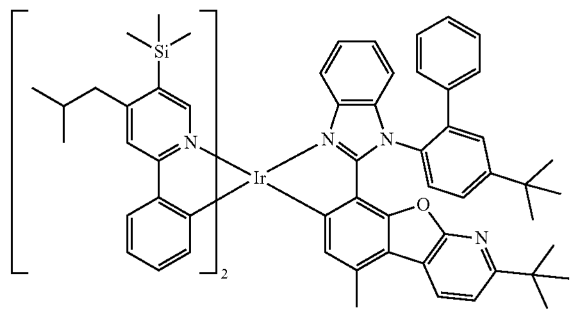
153
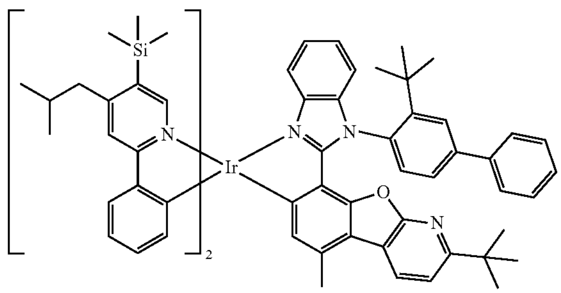
154
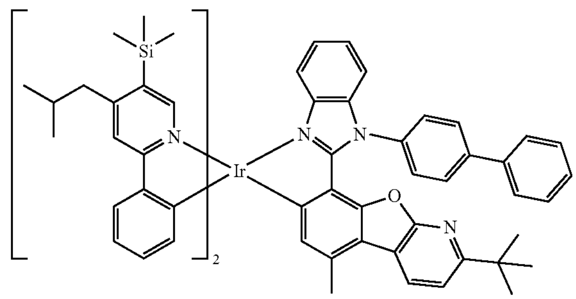
155
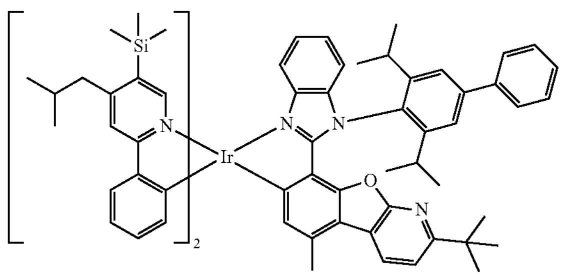
156
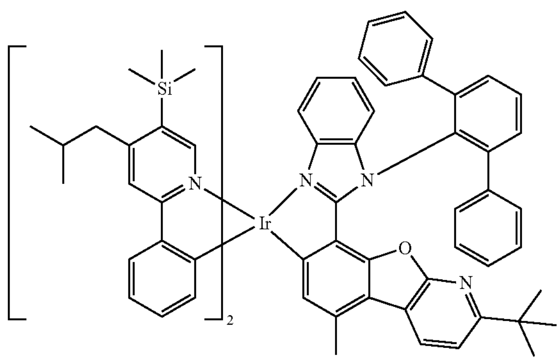
157
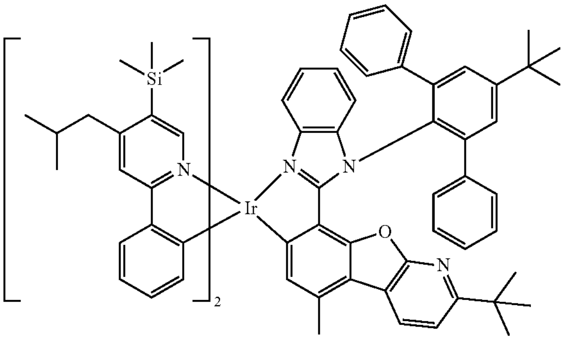
158
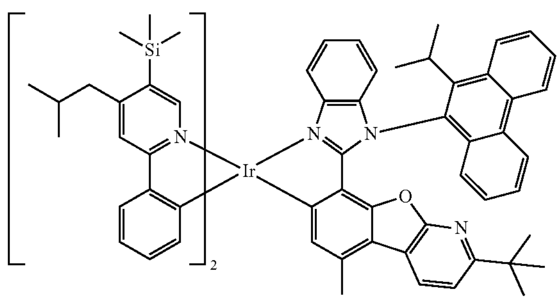
159
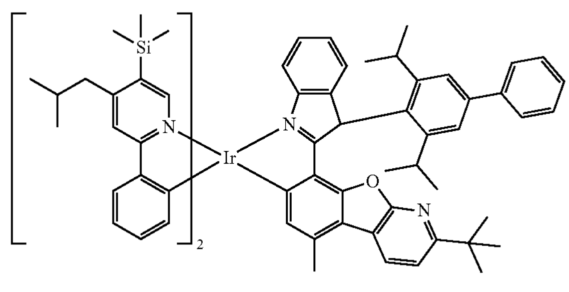

-continued
160
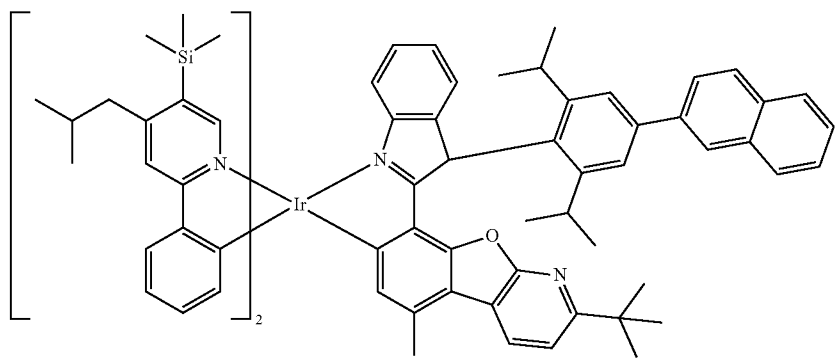
161
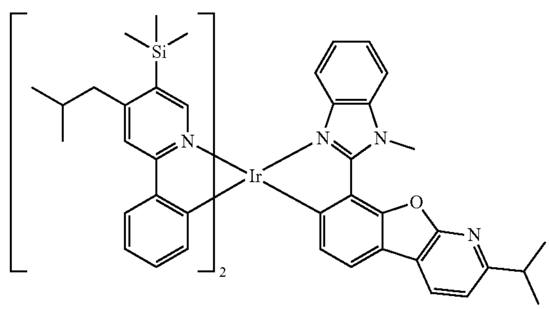
162
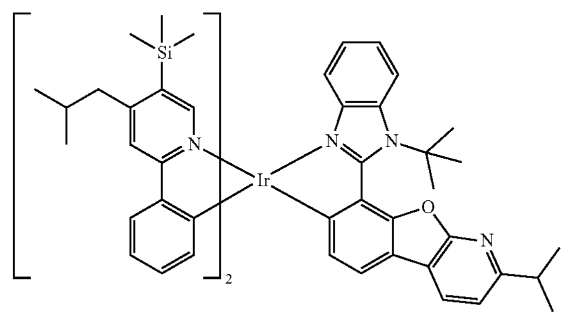
163
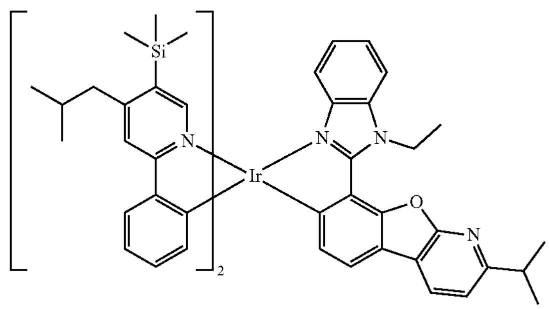
164
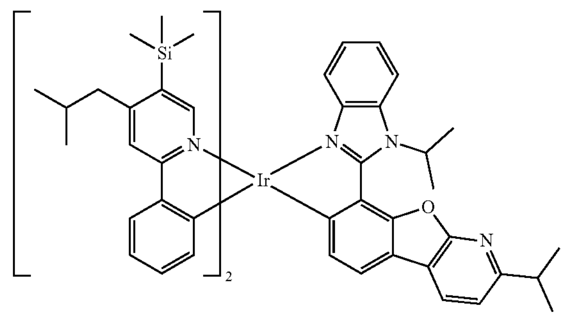
165
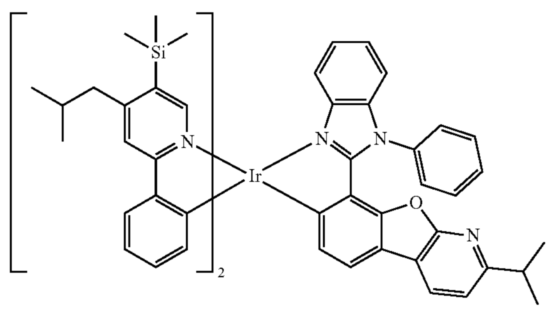
166
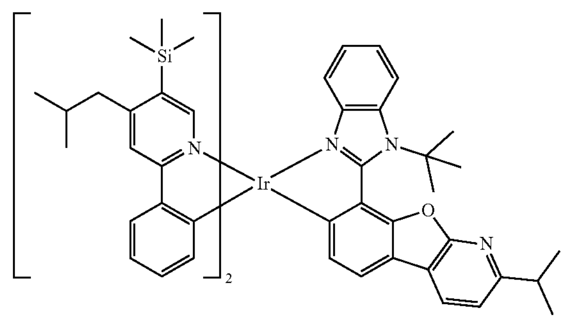

-continued
167
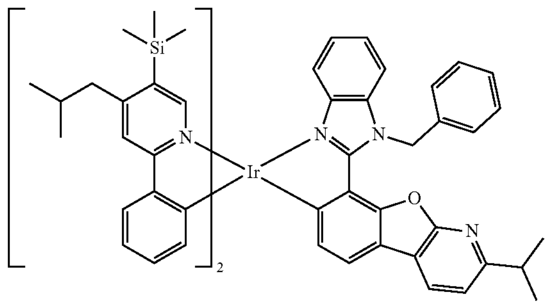
168
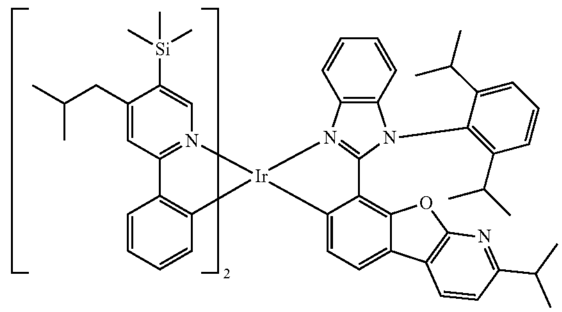
169
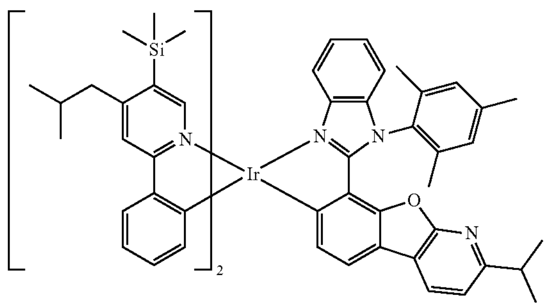
170
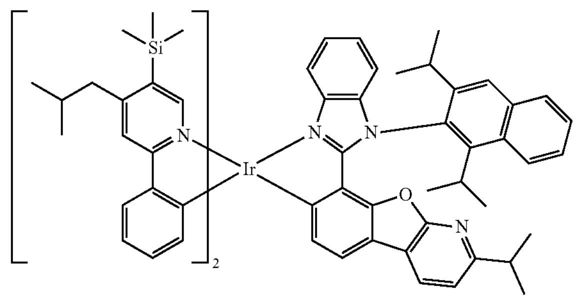
171
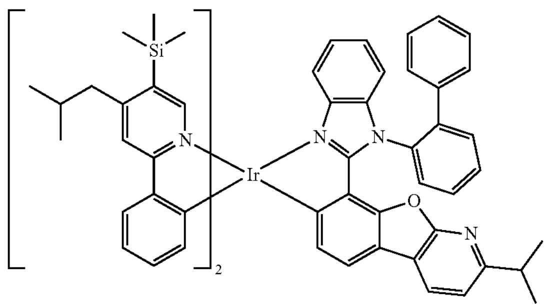
172
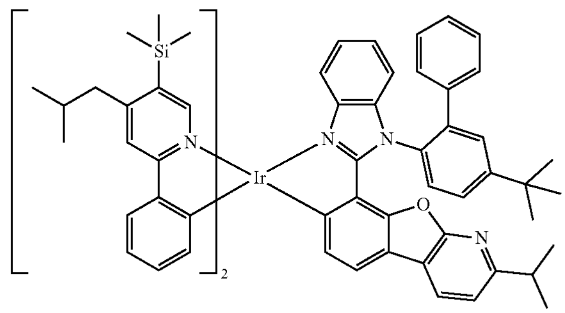
173
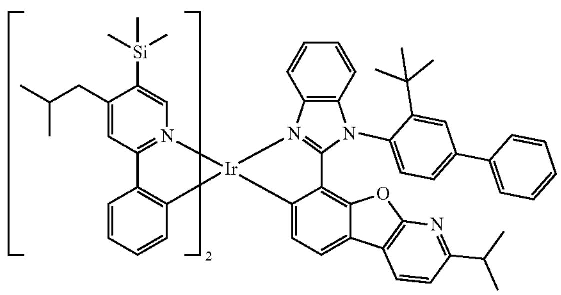
174
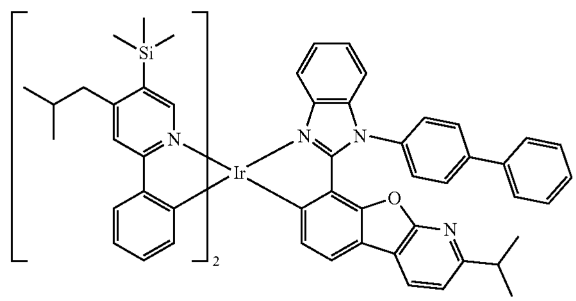

-continued
175
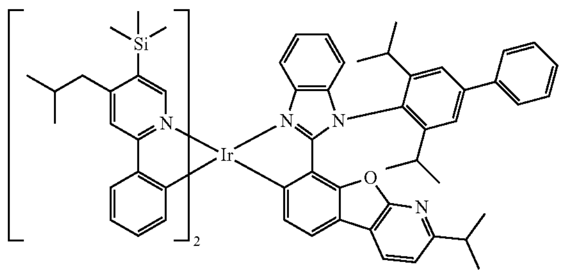
176
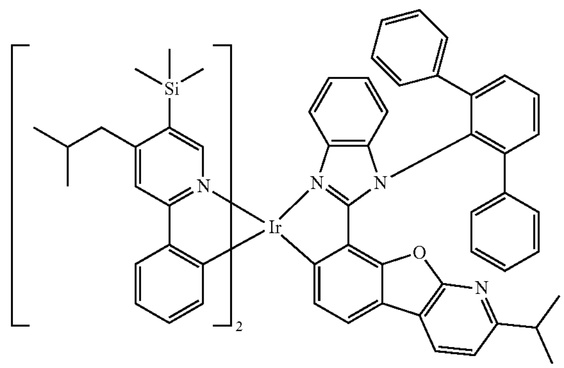
177
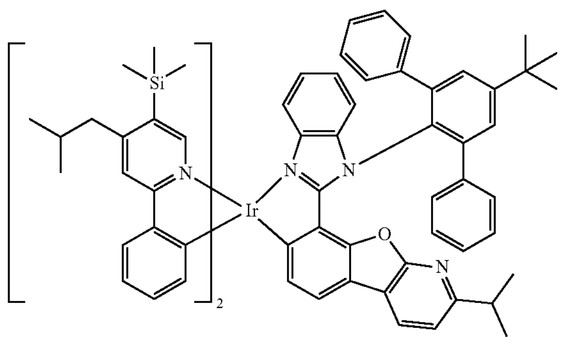
178
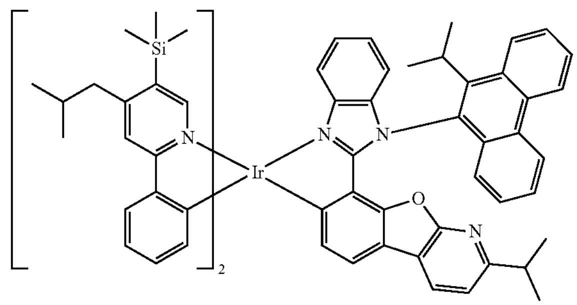
179
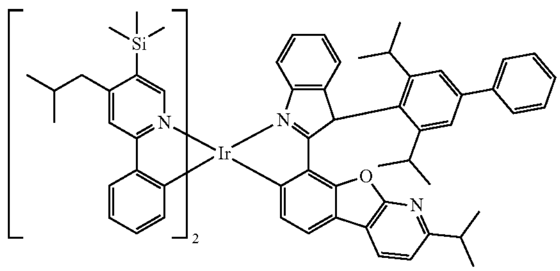
180
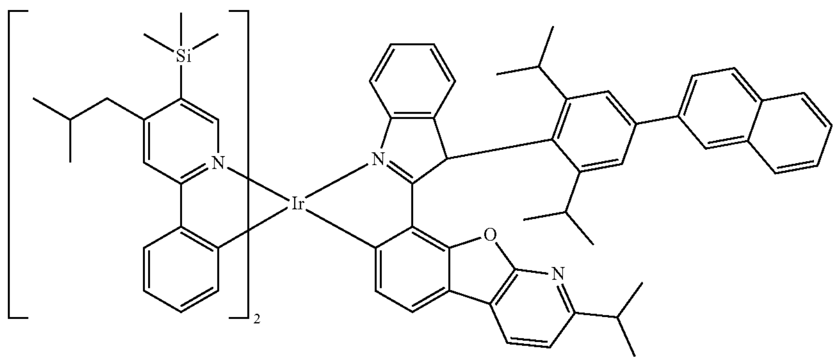

-continued
181
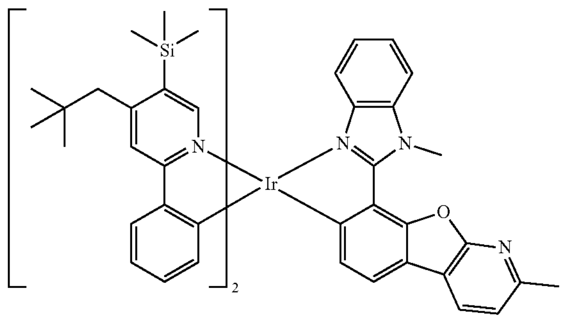
182
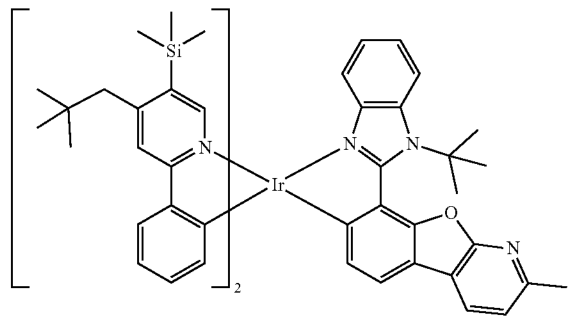
183
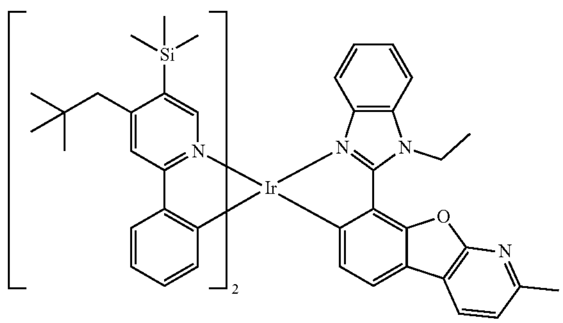
184
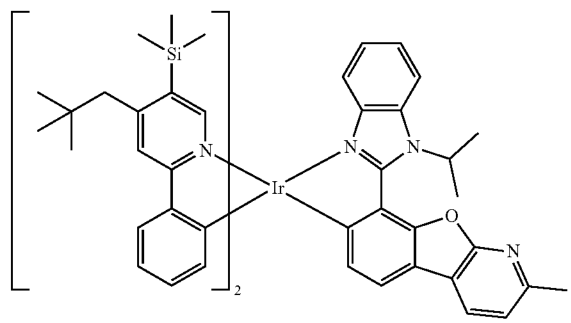
185
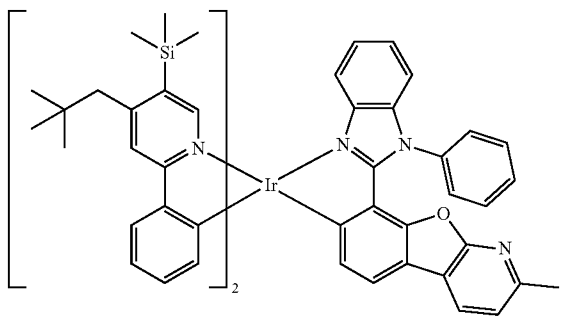
186
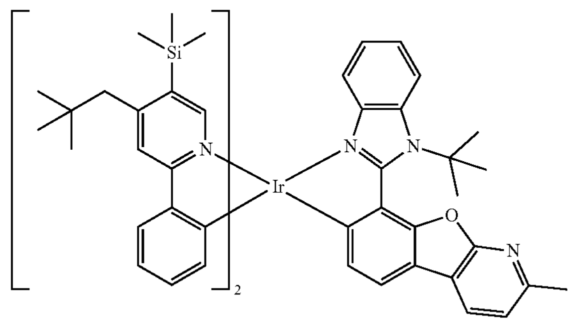
187
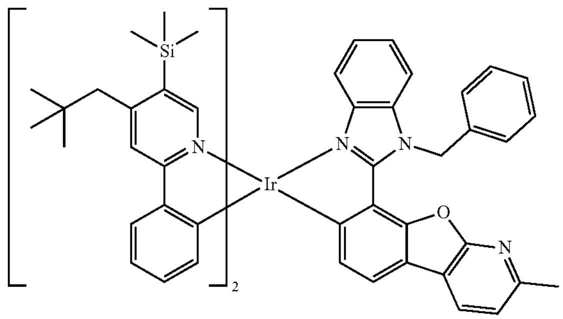
188
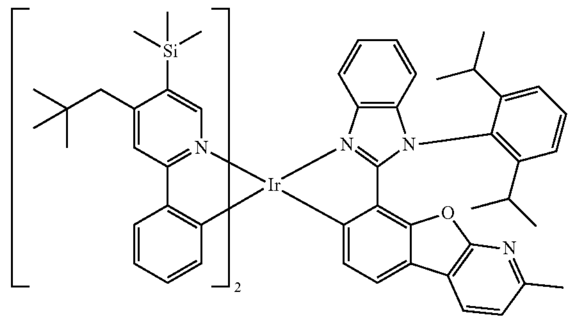

-continued
189
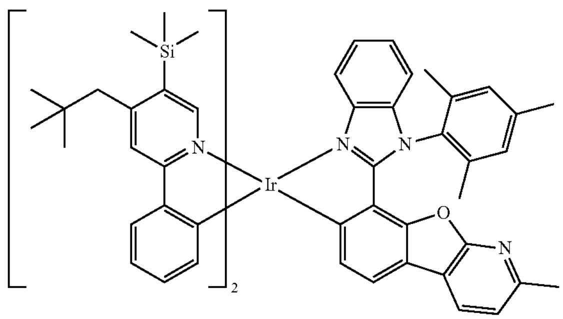
190
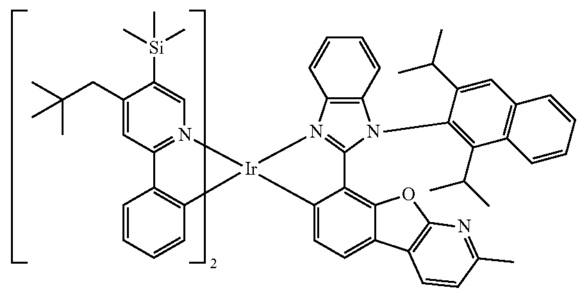
191
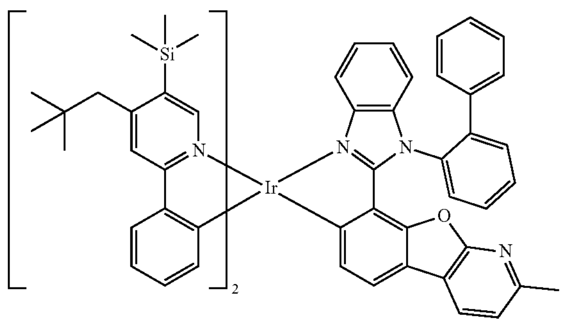
192
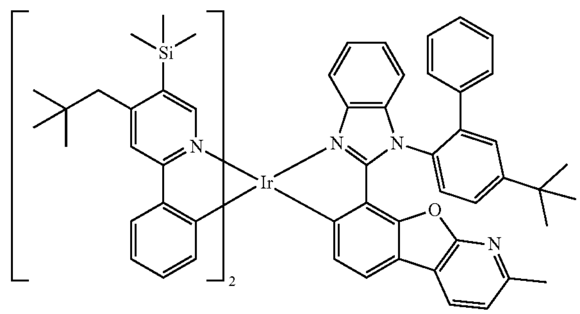
193
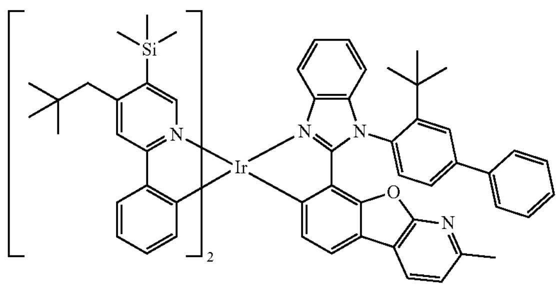
194
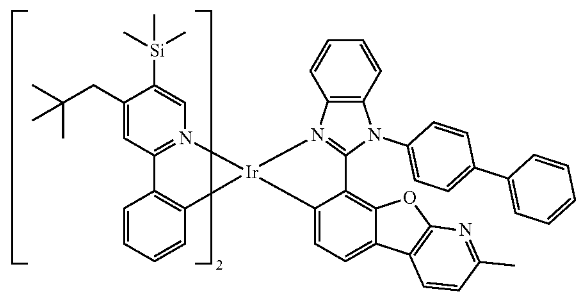
195
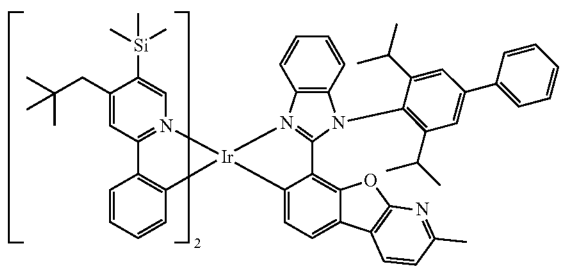
196
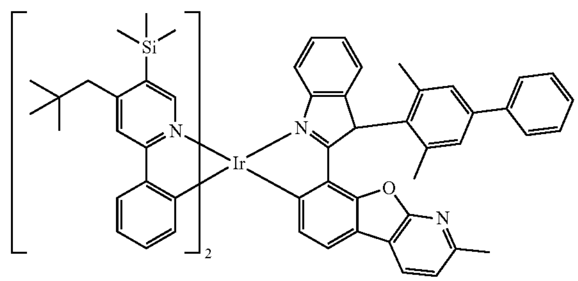

-continued
197
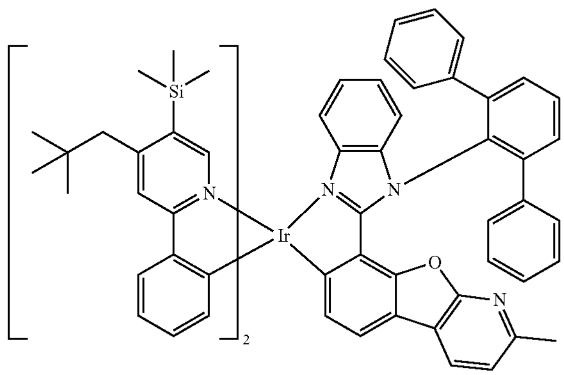
198
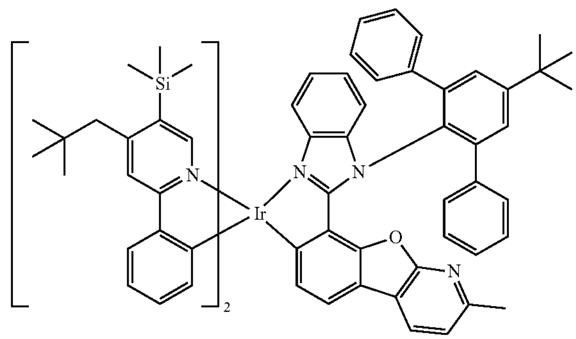
199
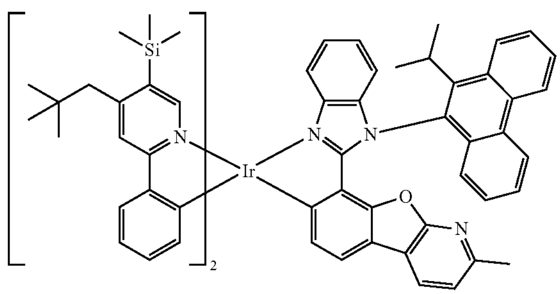
200
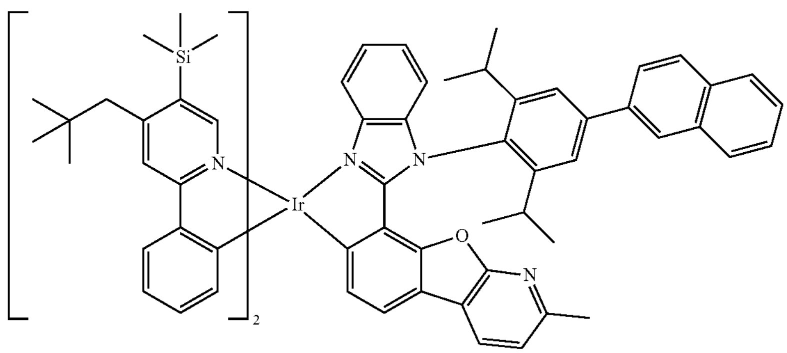
201
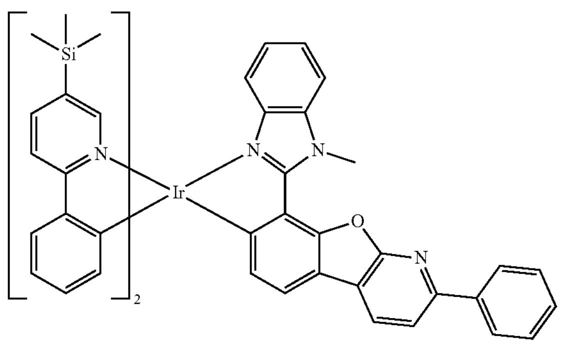
202
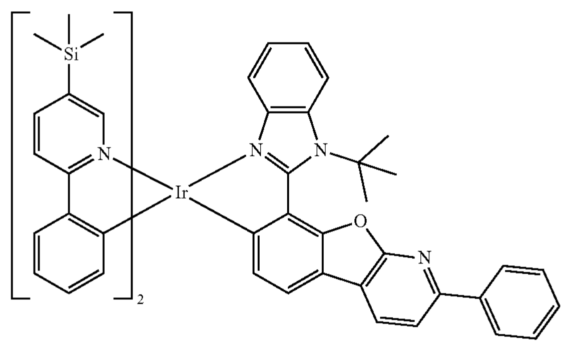

-continued
203
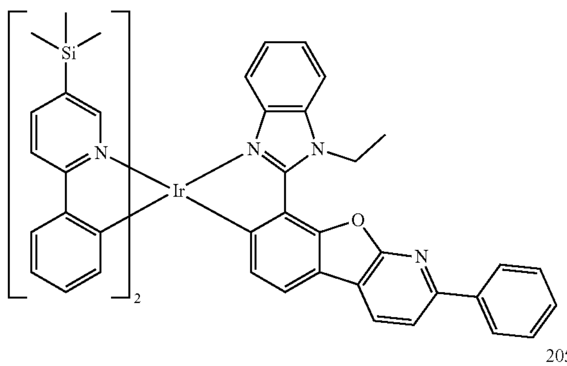
204
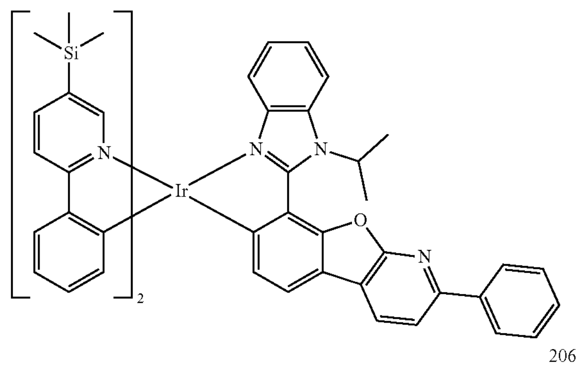
205
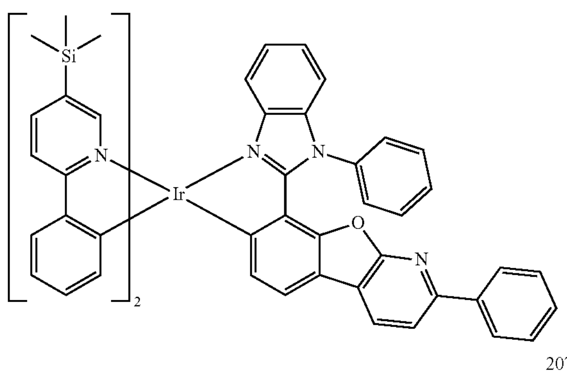
206
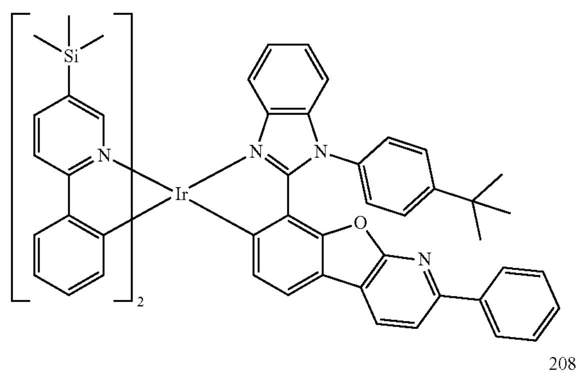
207
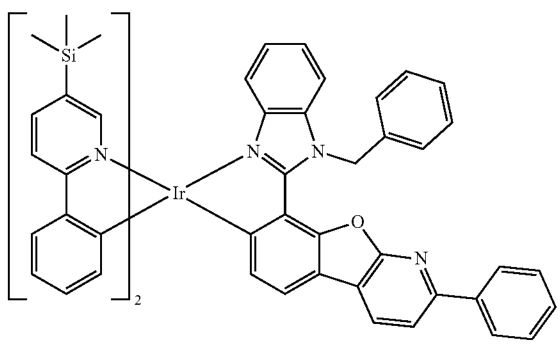
208
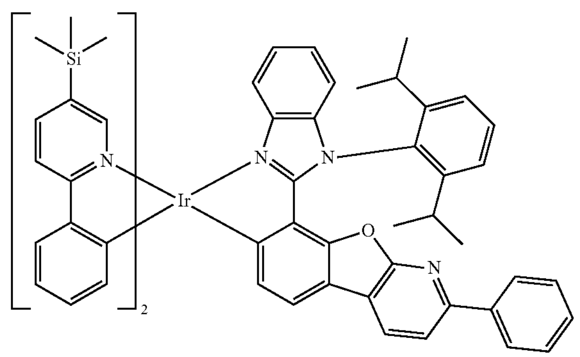
209
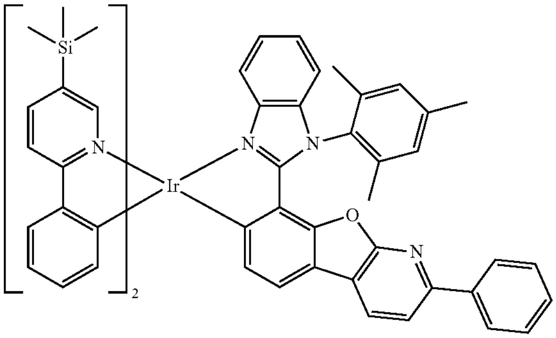
210
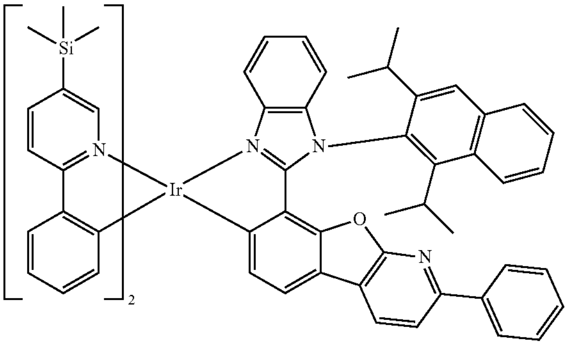

-continued
211
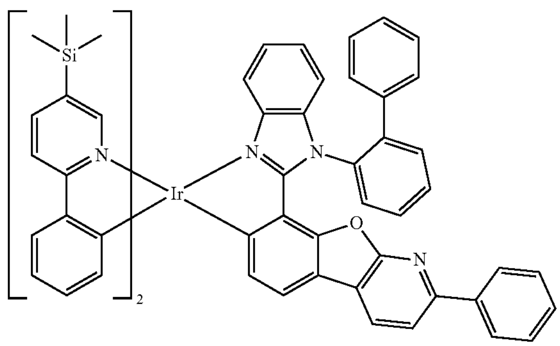
212
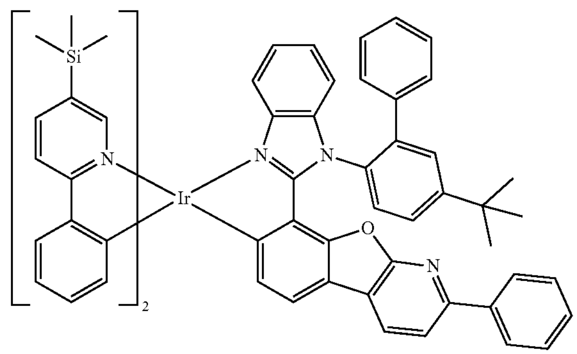
213
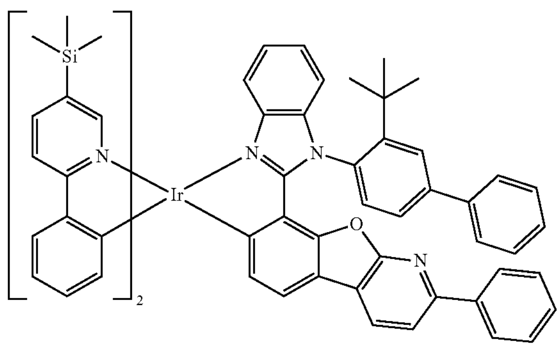
214
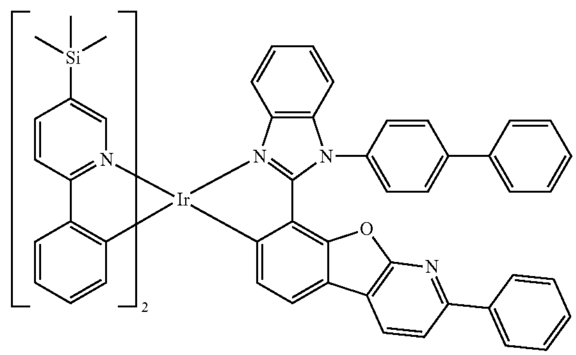
215
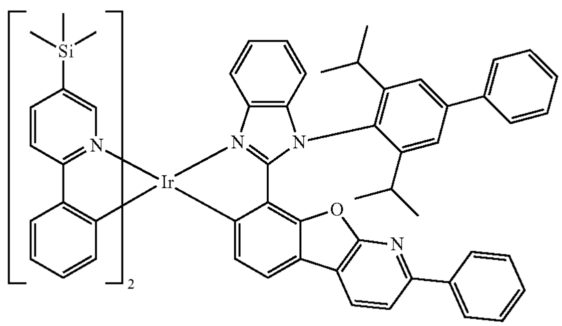
216
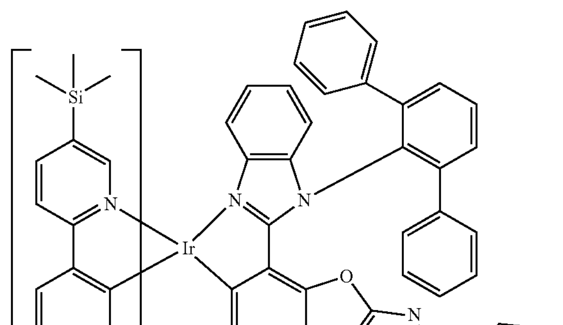
217
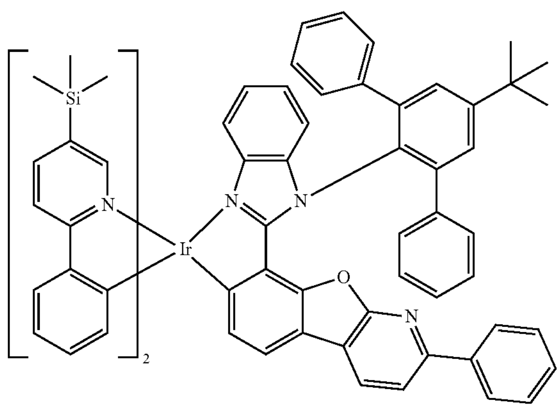
218
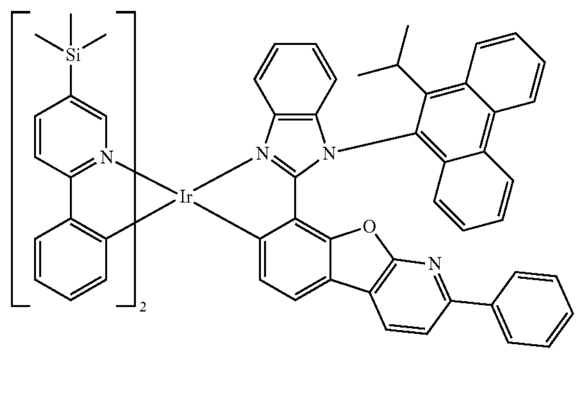

-continued
219
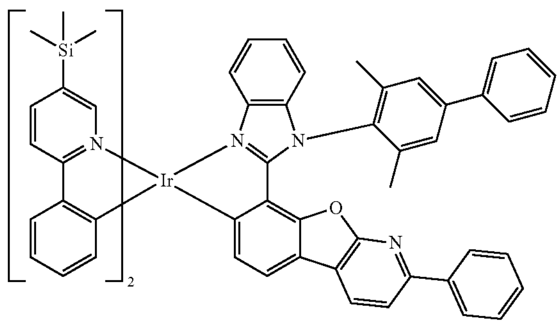
220
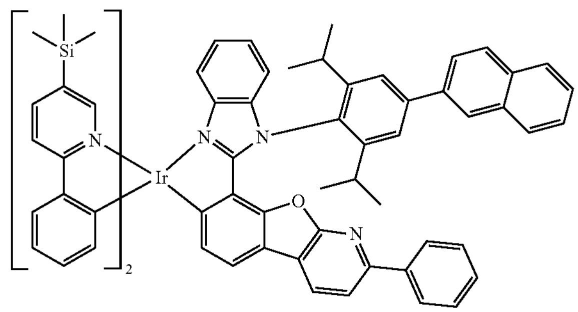
221
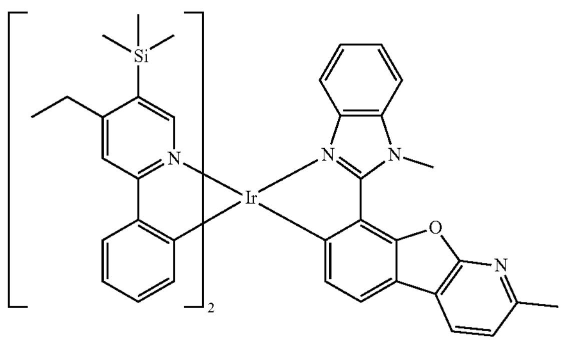
222
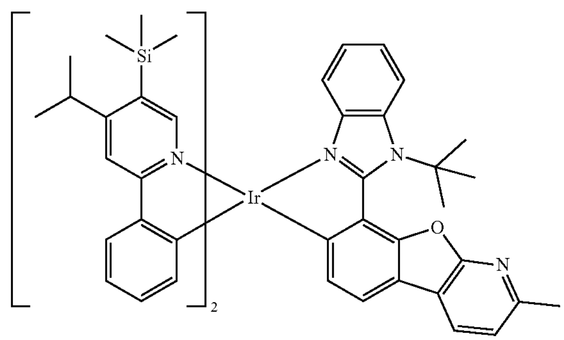
223
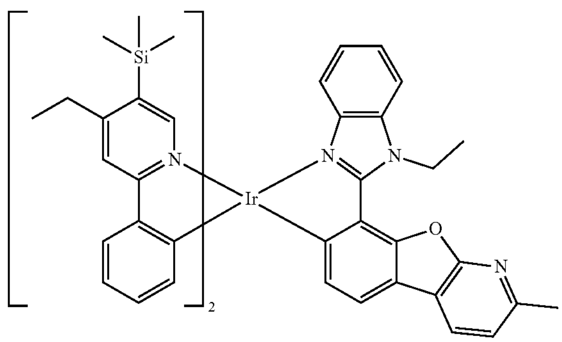
224
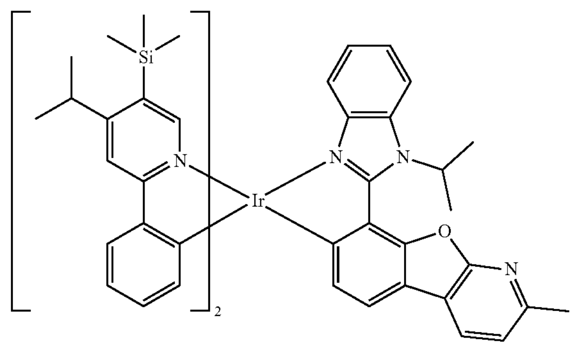
225
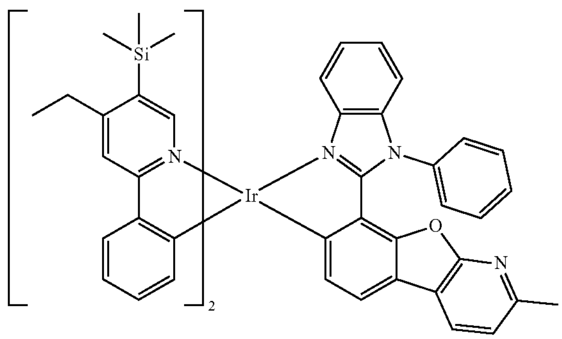
226
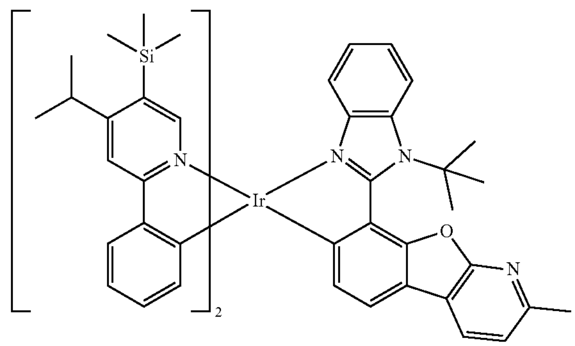

-continued
227
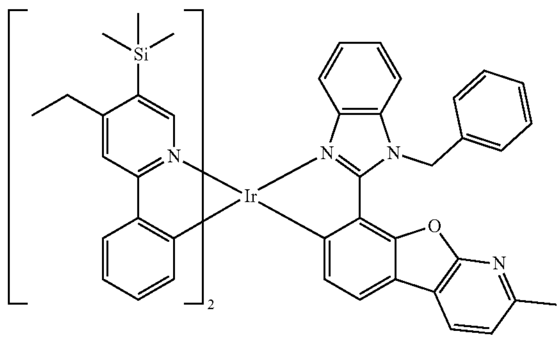
228
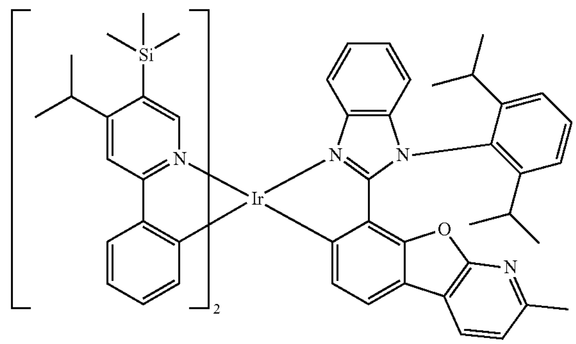
229
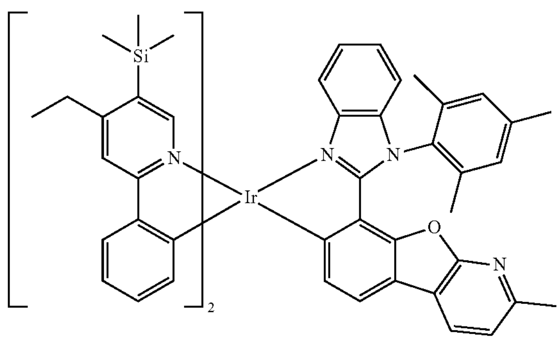
230
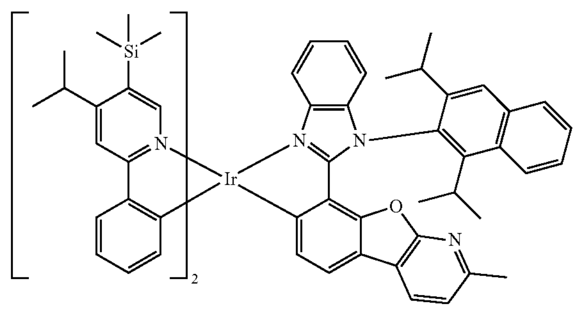
231
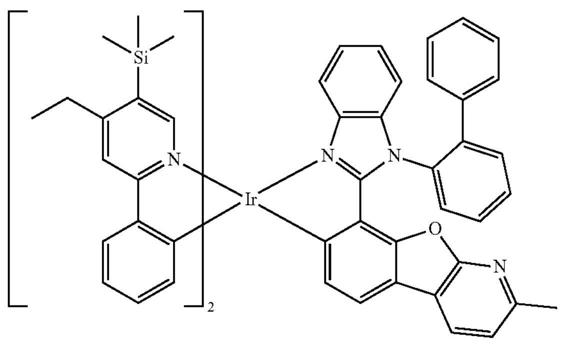
232
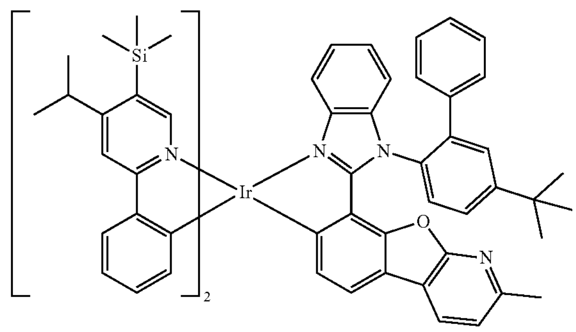
233
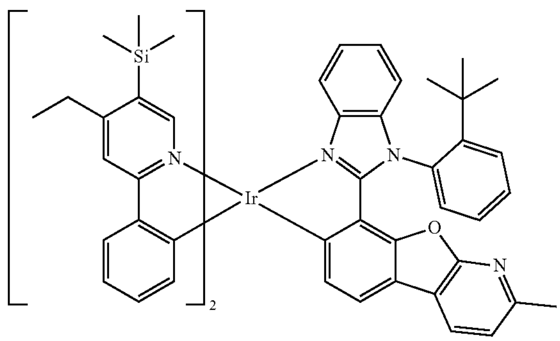
234
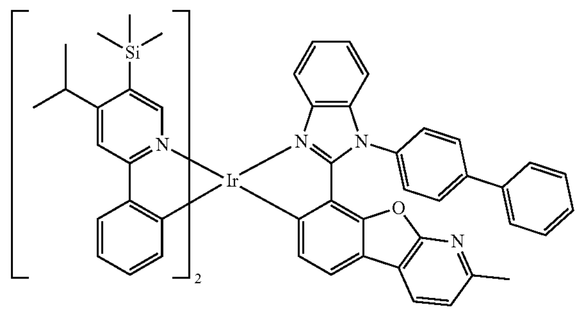

-continued
235
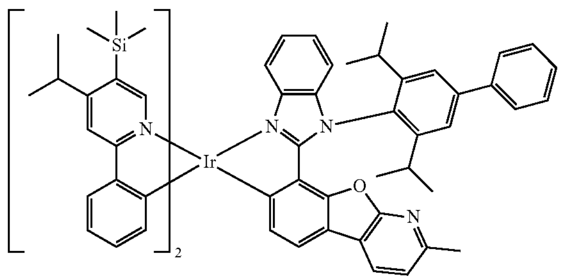
236
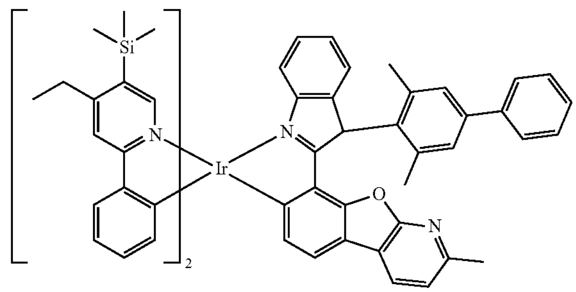
237
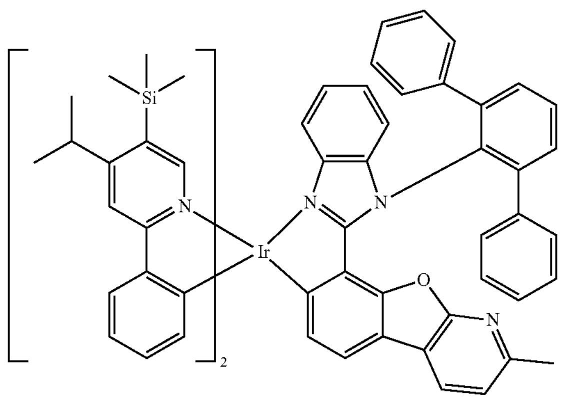
238
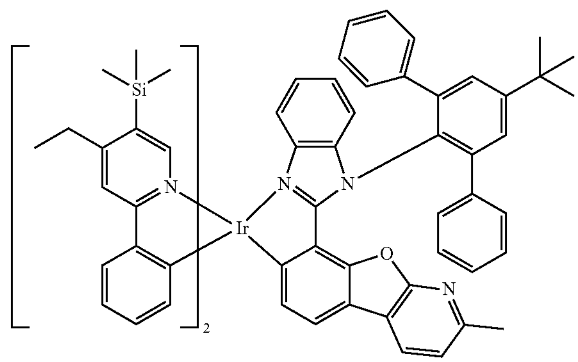
239
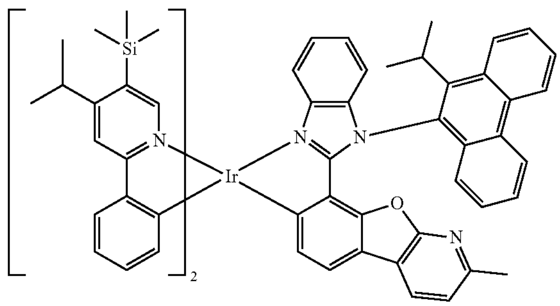
240
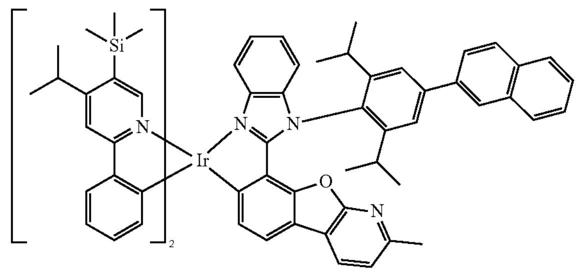
241
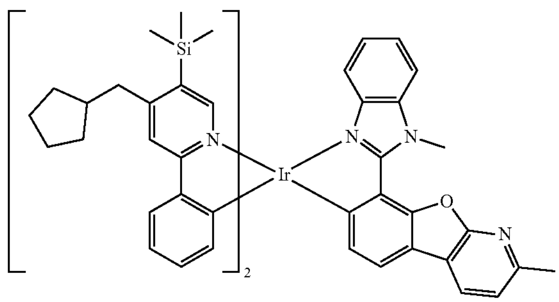
242
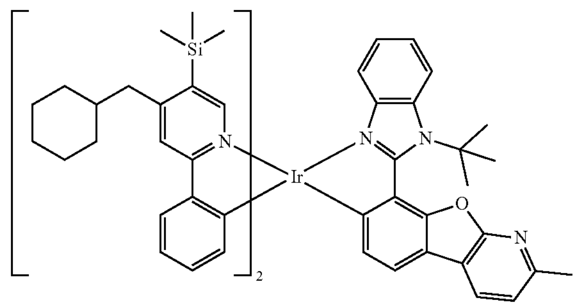

-continued
243
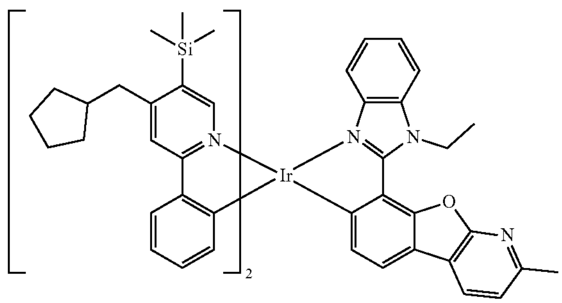
244
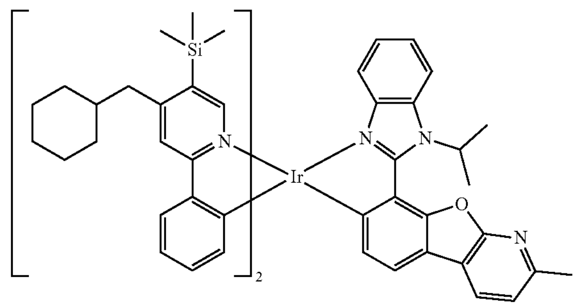
245
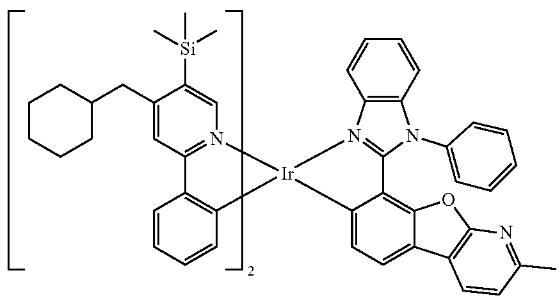
246
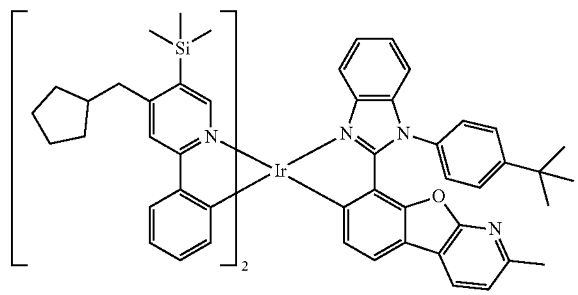
247
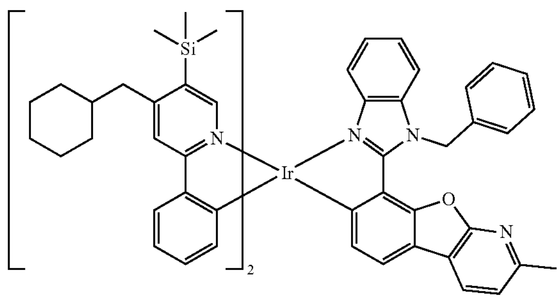
248
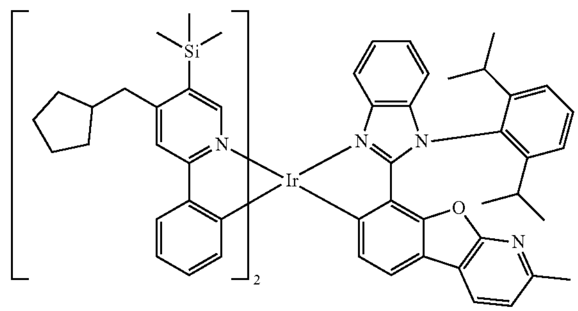
249
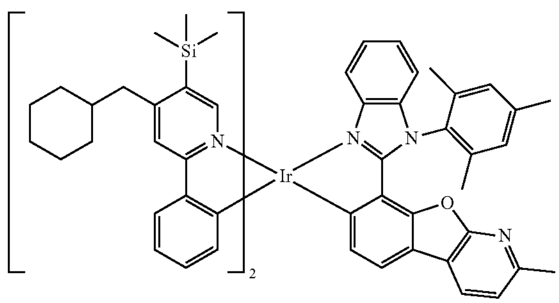
250
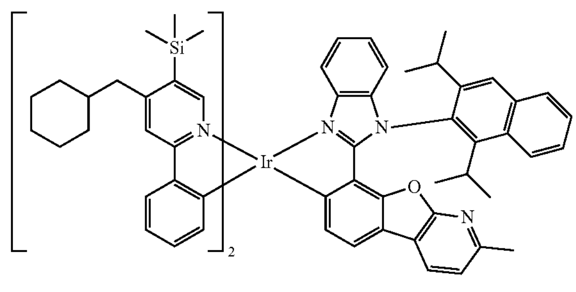
251
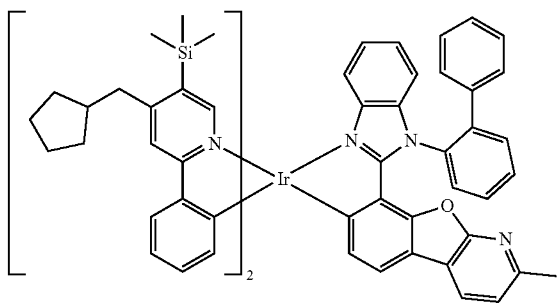
252
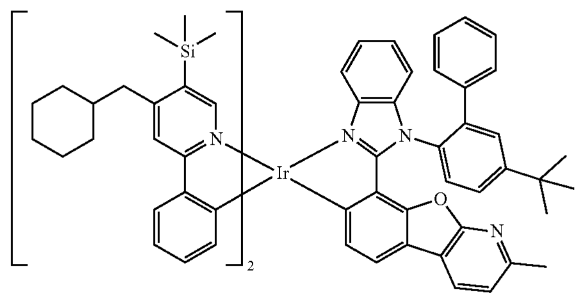

-continued
253
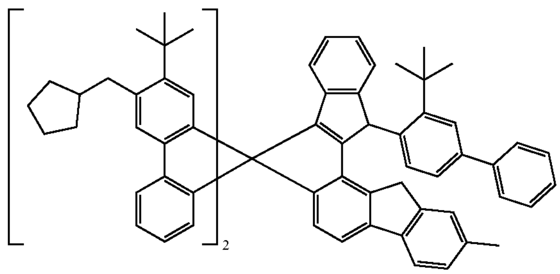
254
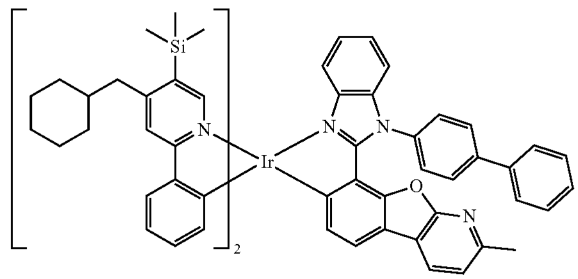
255
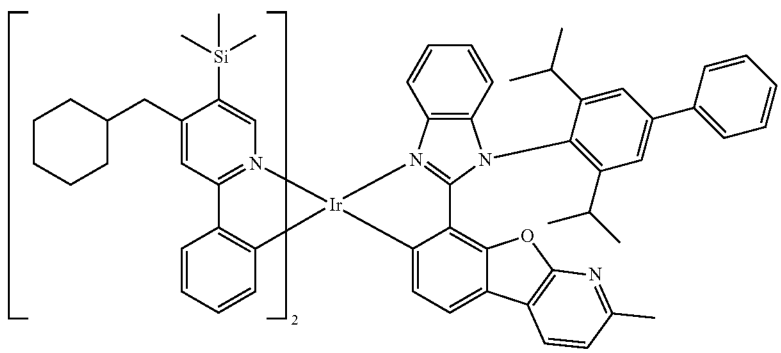
256
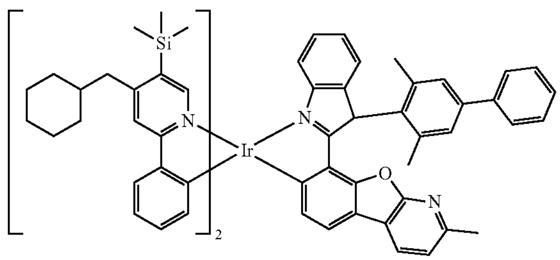
257
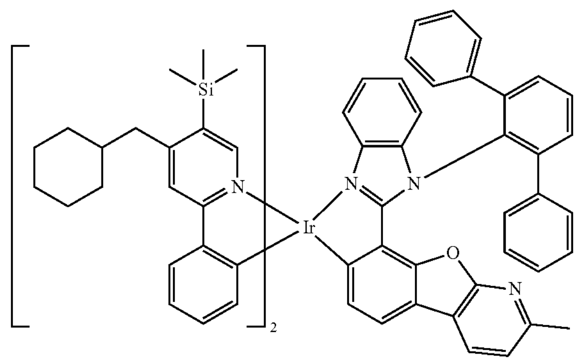
258
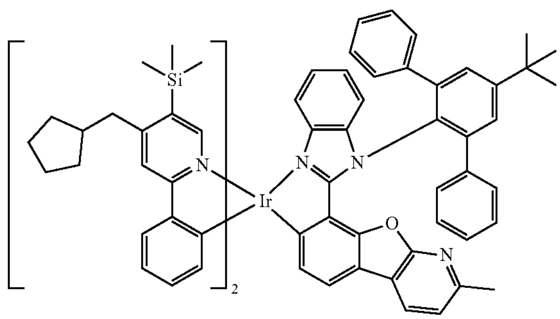
259
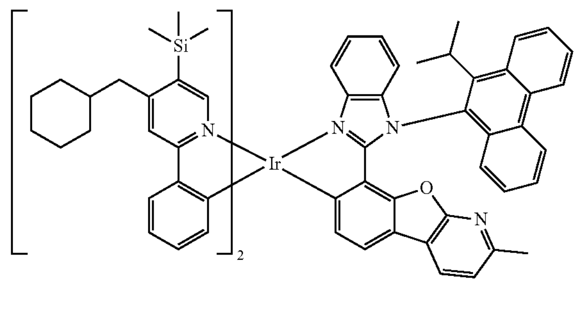

-continued
260
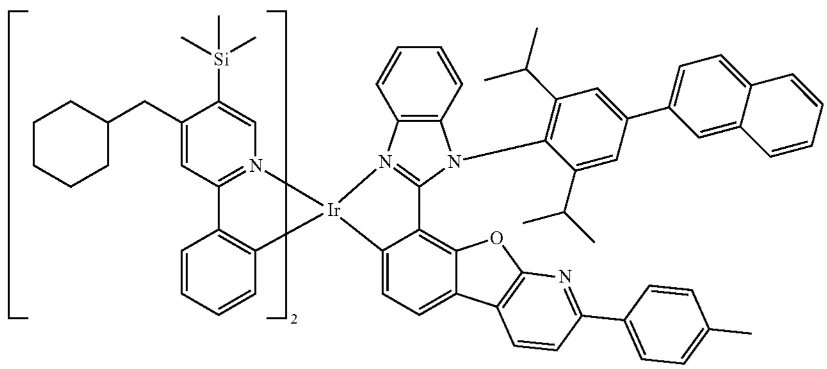
261
262
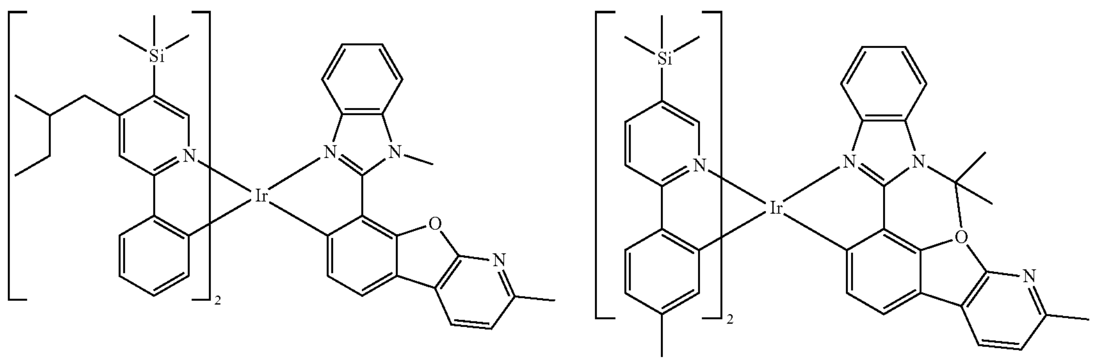
263
264
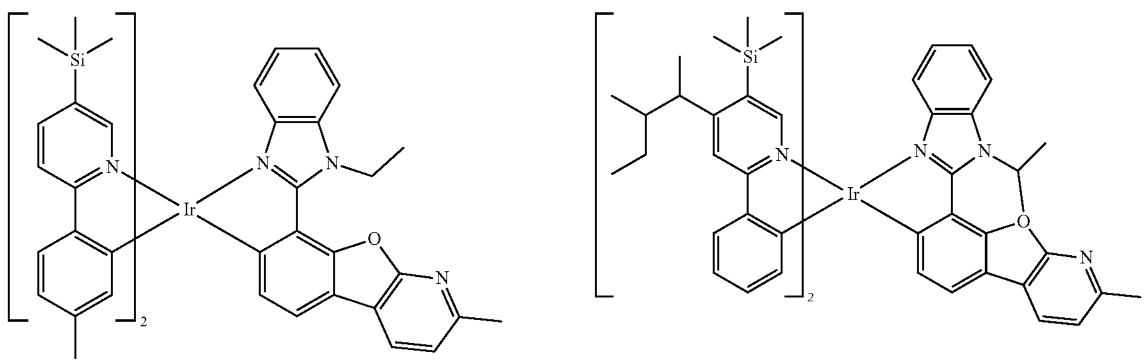
265
266
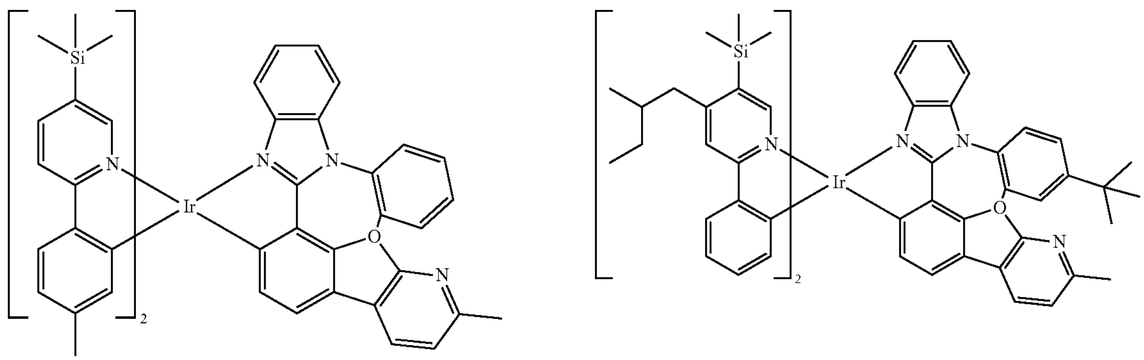

-continued
267
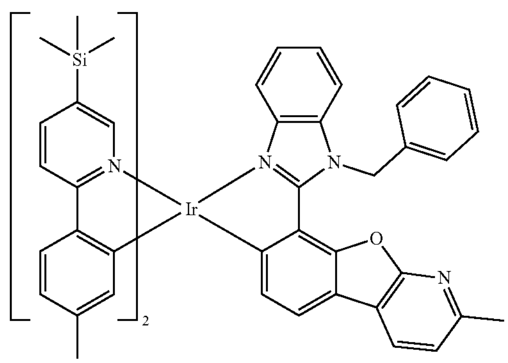
268
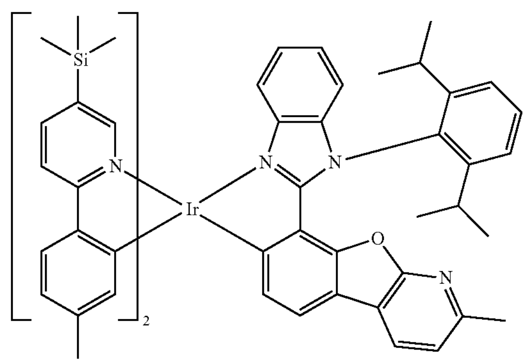
269
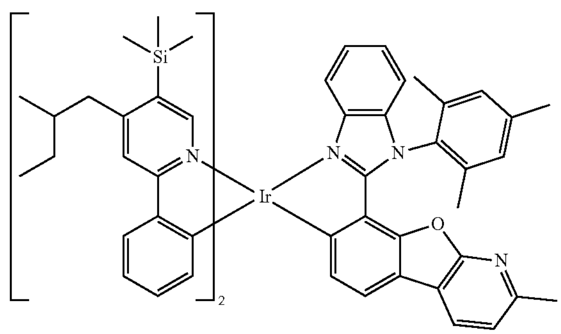
270
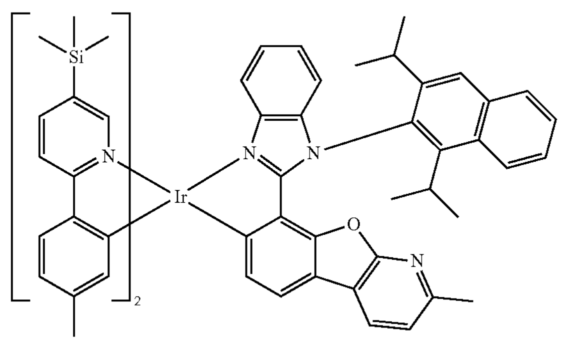
271
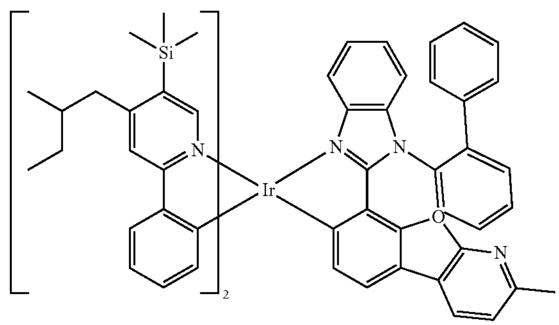
272
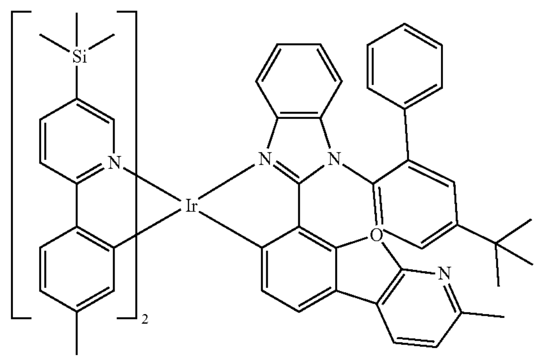
273
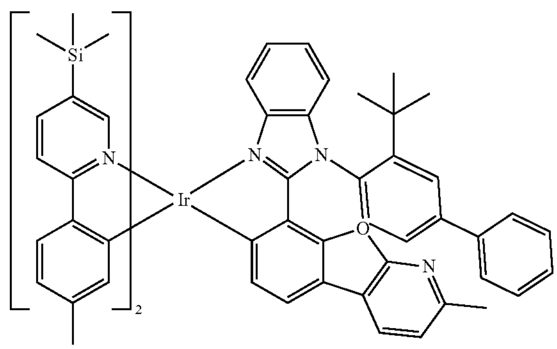
274
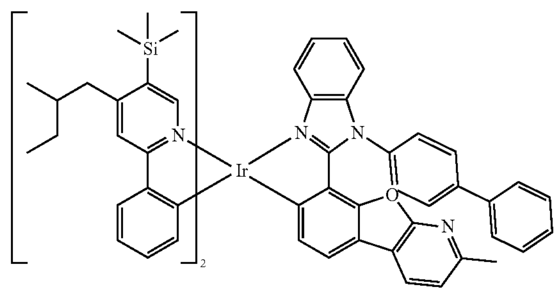

-continued
275
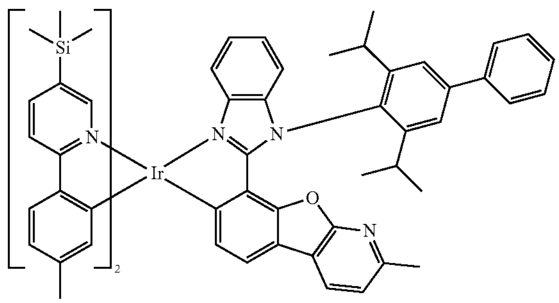
276
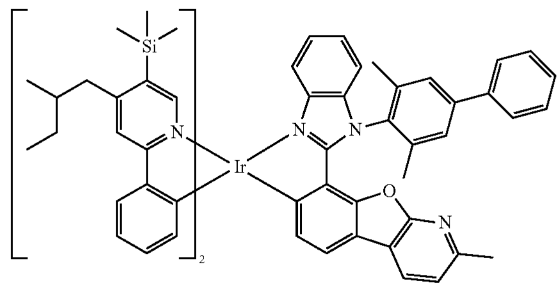
277
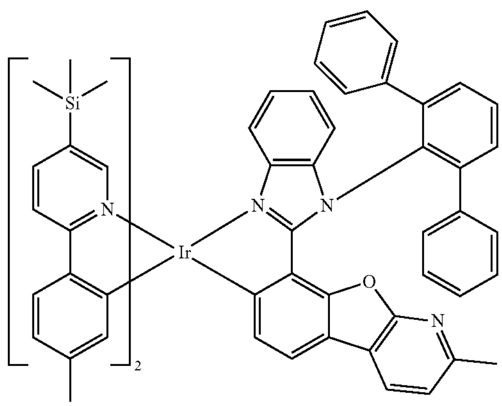
278
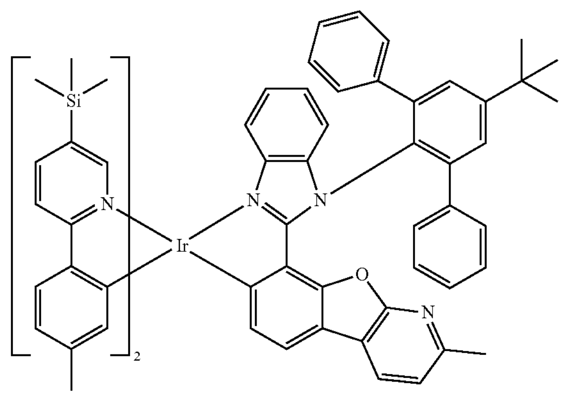
279
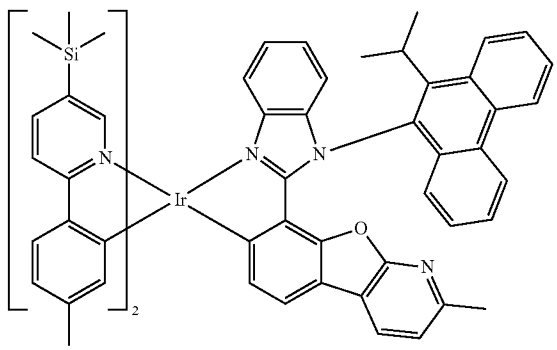
280
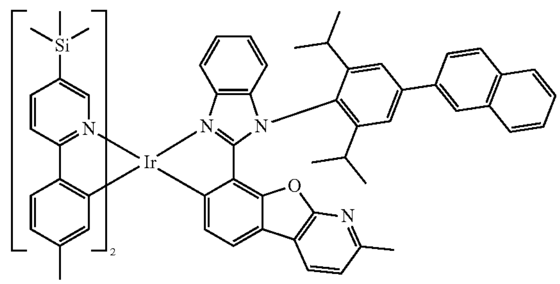
281
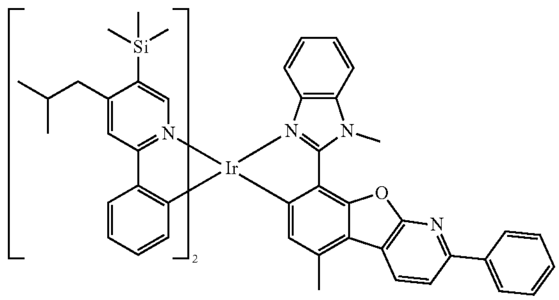
282
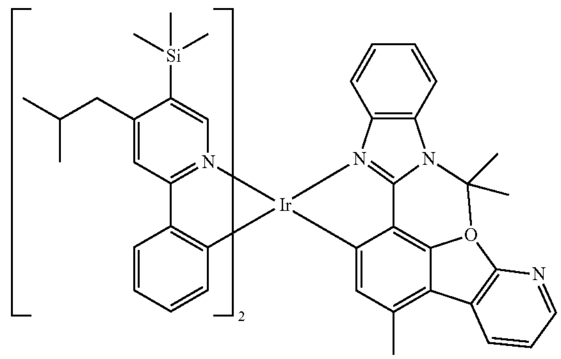

-continued
283
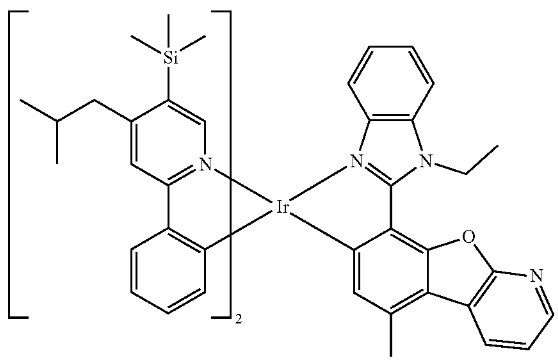
284
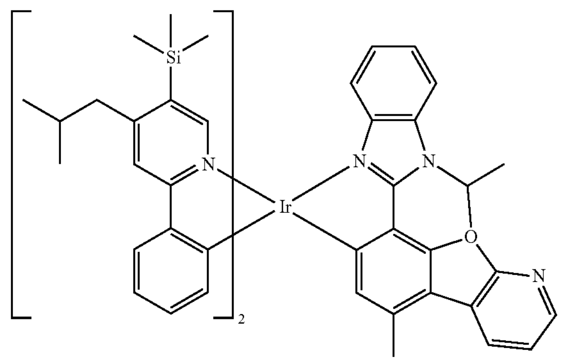
285
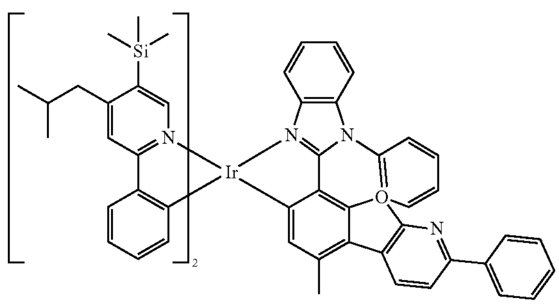
286
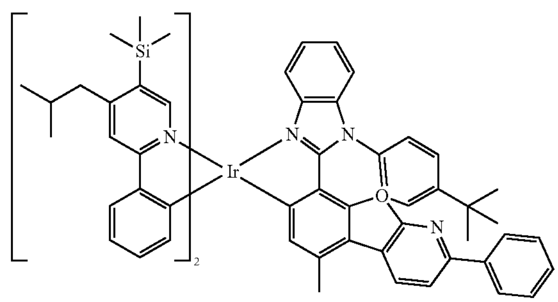
287
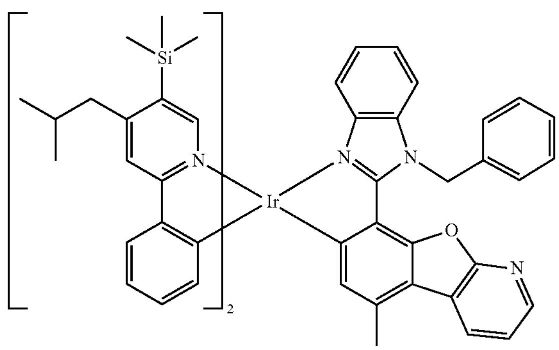
288
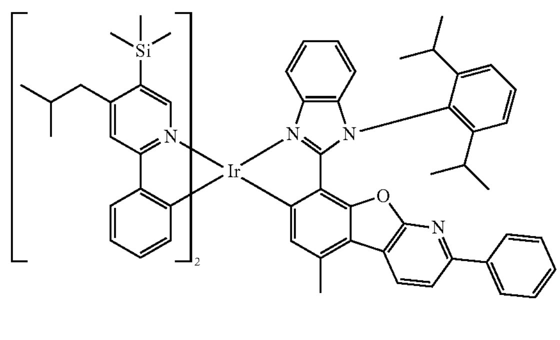
289
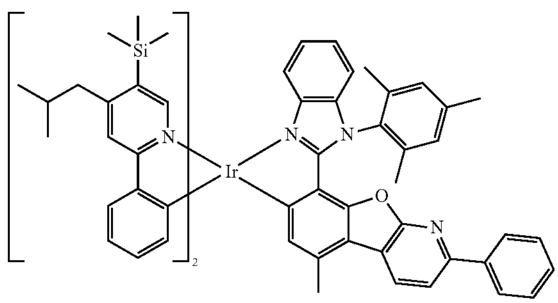
290
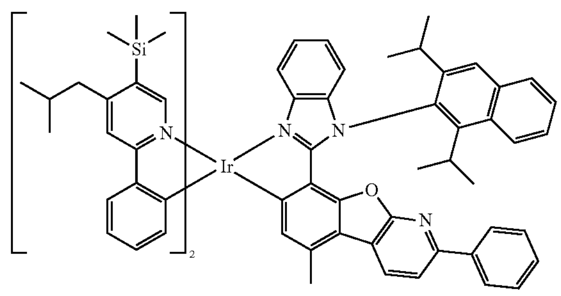

-continued
291
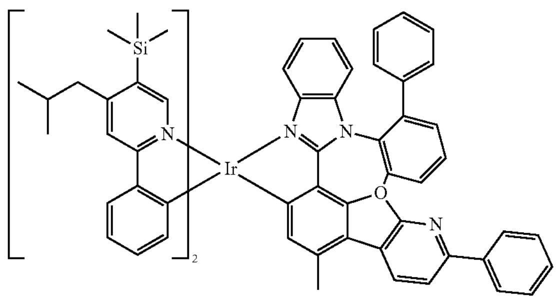
292
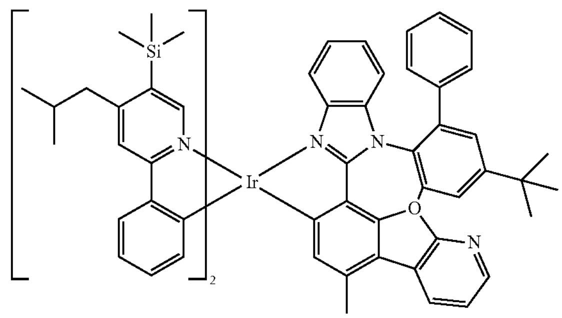
293
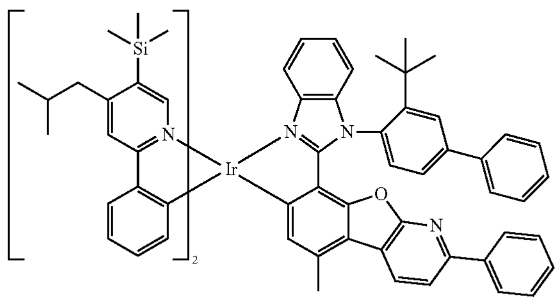
294
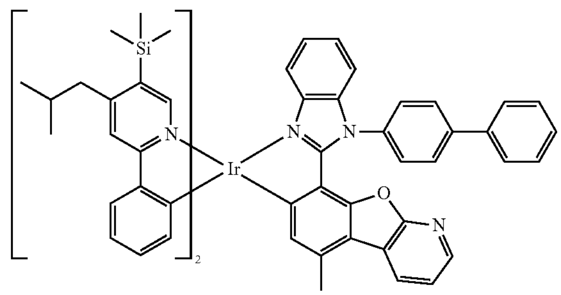
295
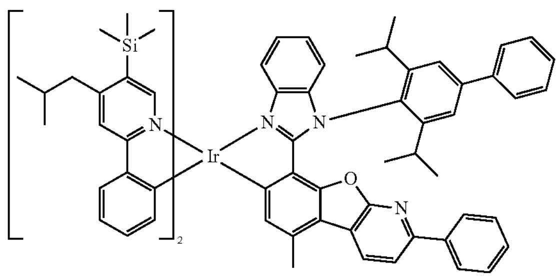
296
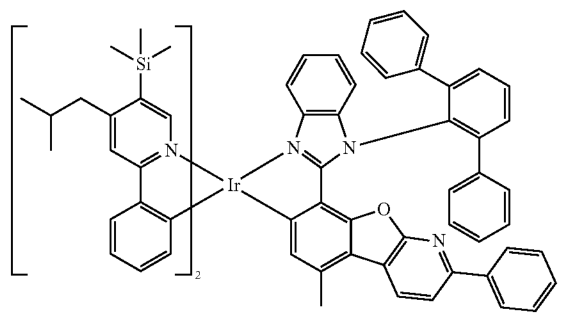
297
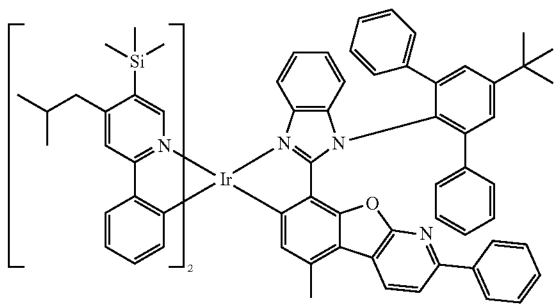
298
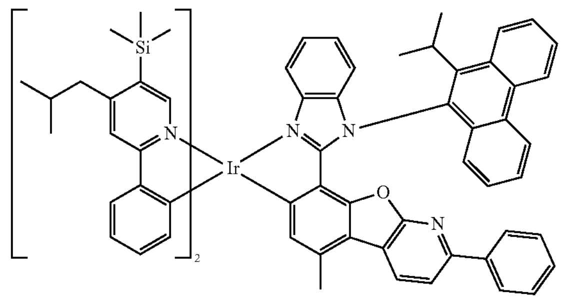
299
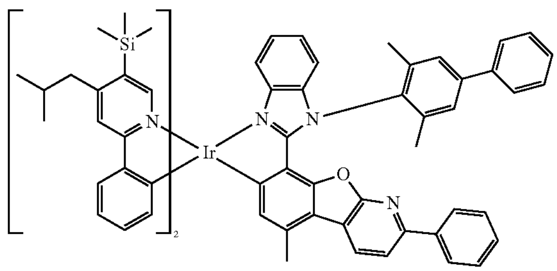

-continued
300
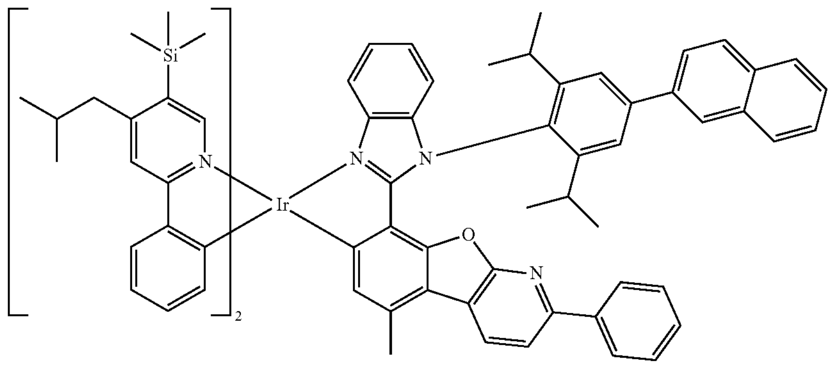
301
302
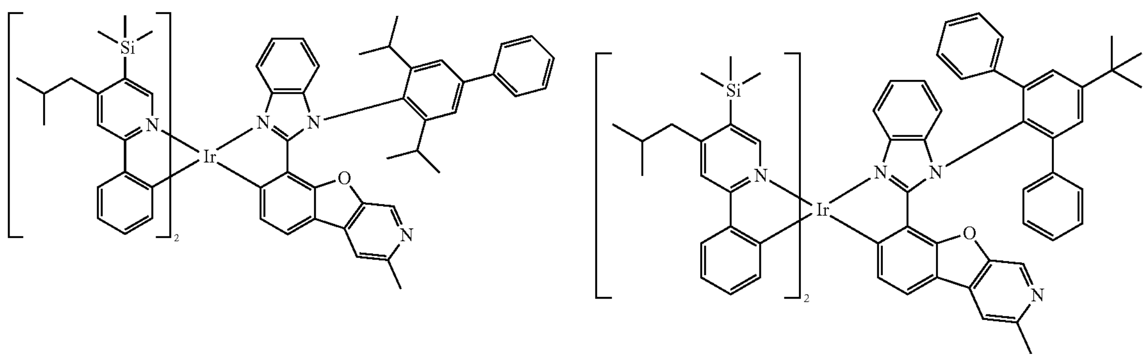
303
304
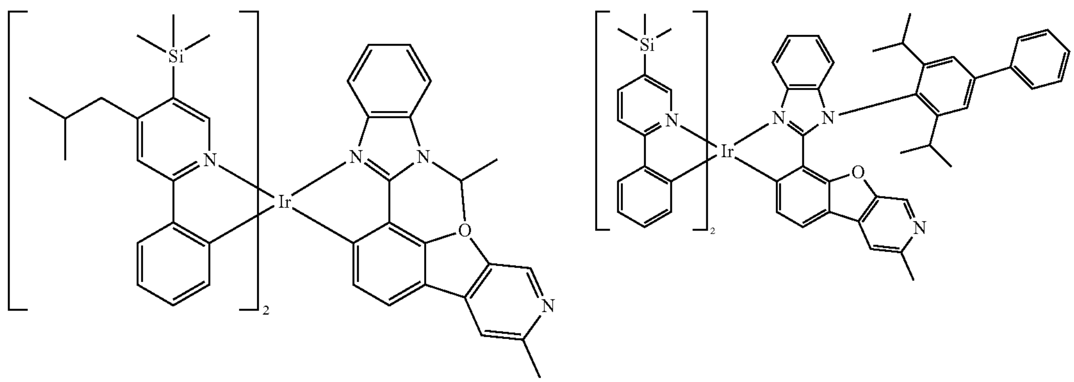
305
306
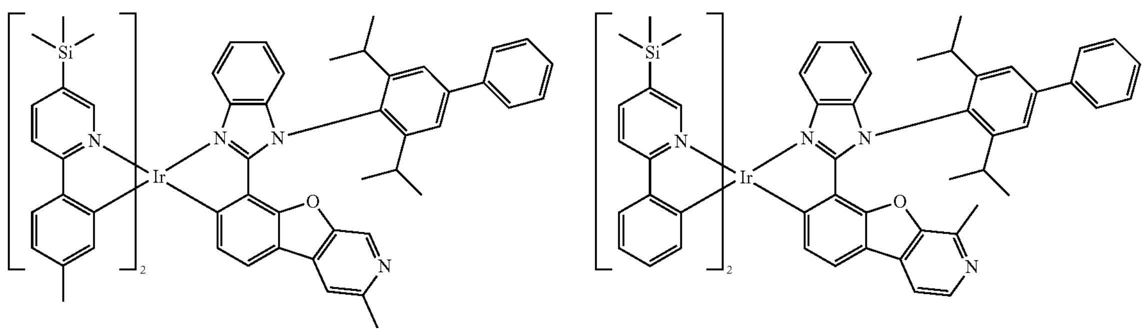

-continued
307
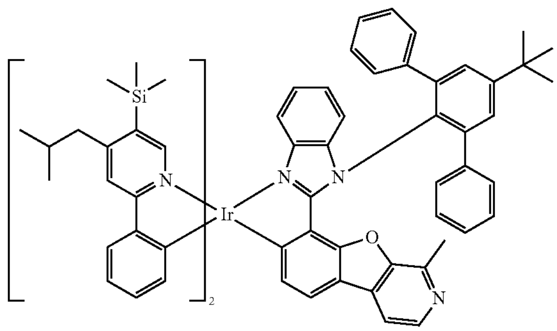
308
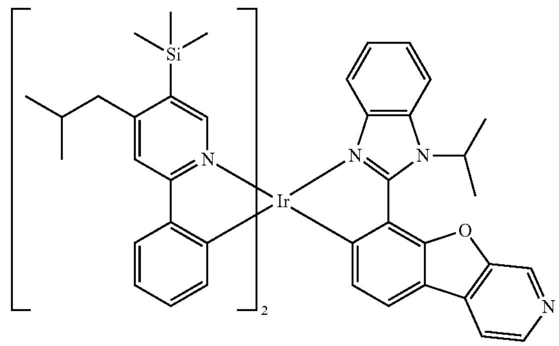
309
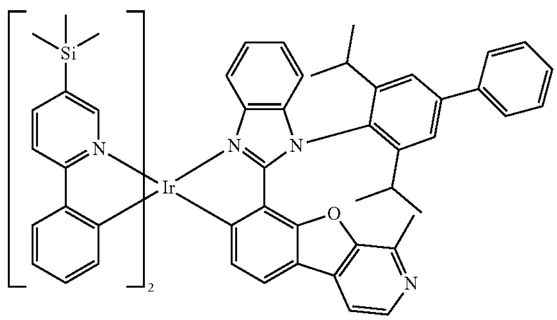
310
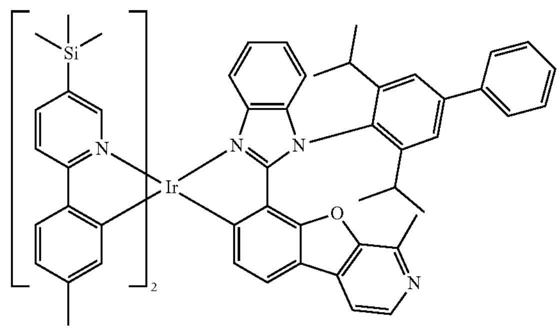
311
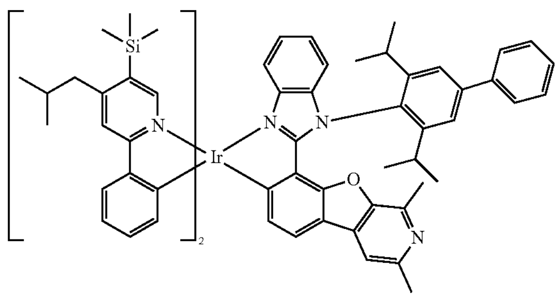
312
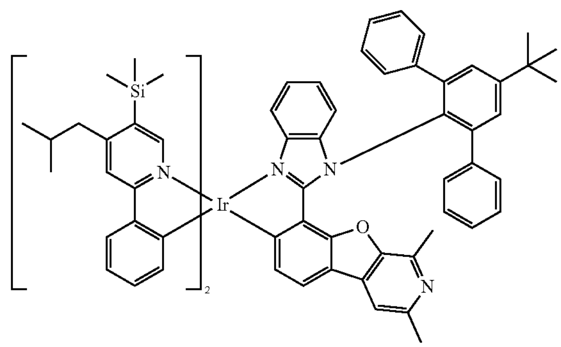
313
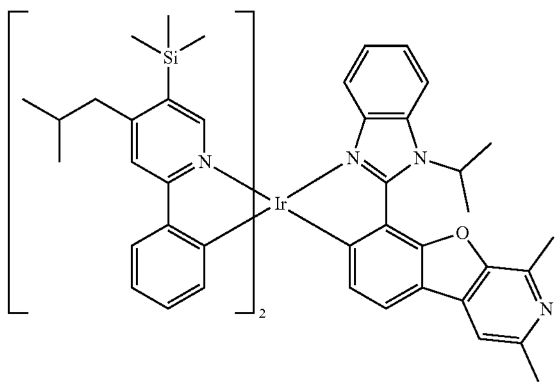
314
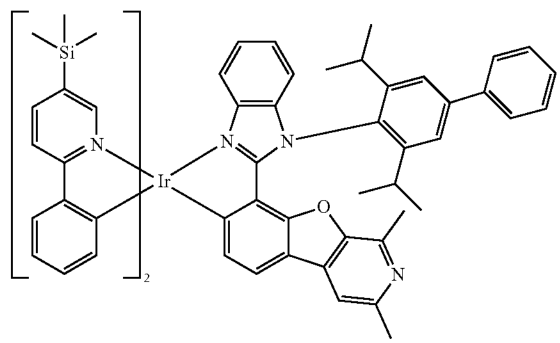

-continued
315
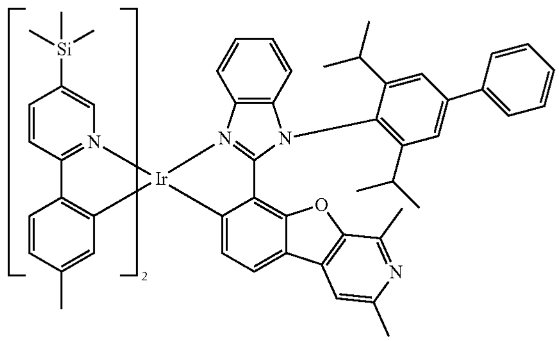
316
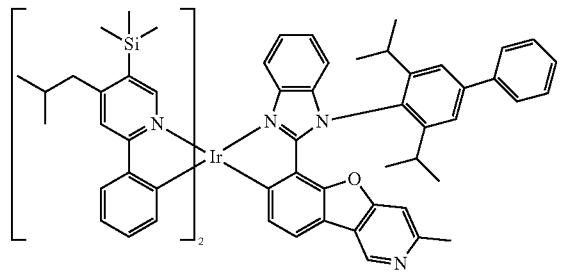
317
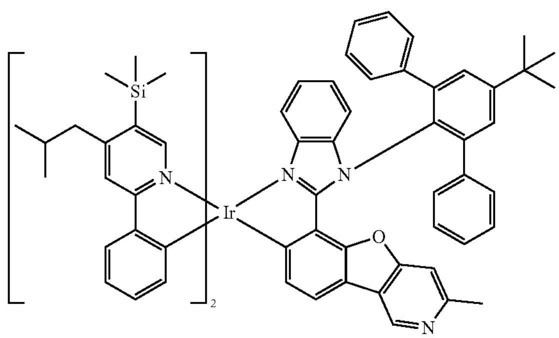
318
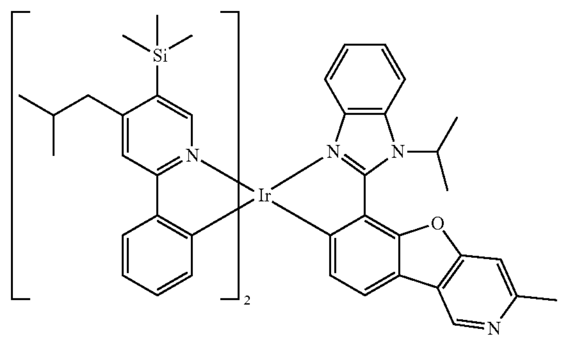
319
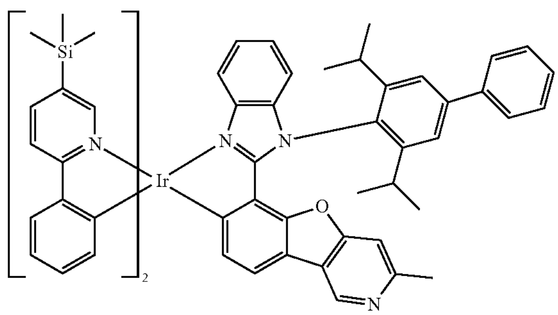
320
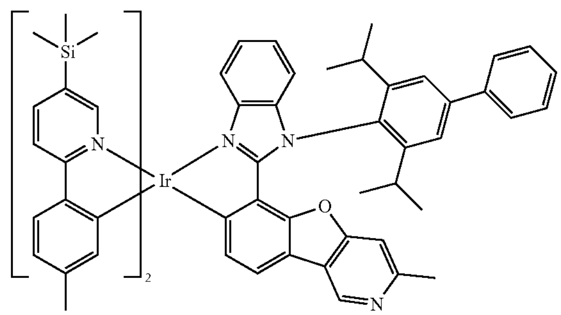
321
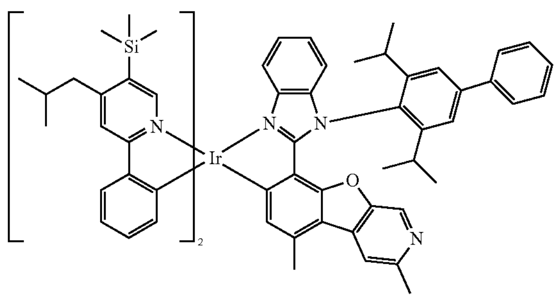
322
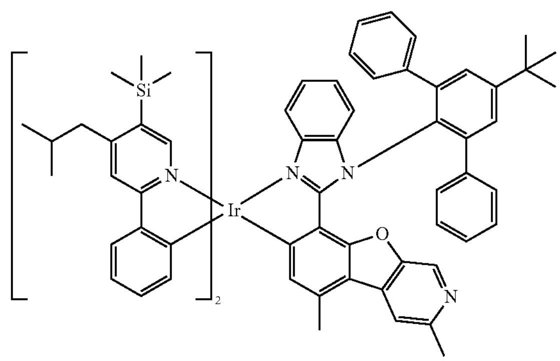

-continued
323
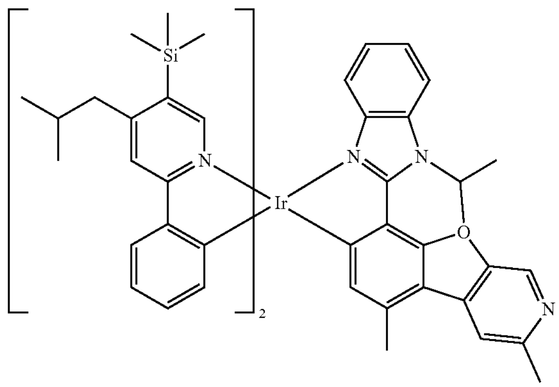
324
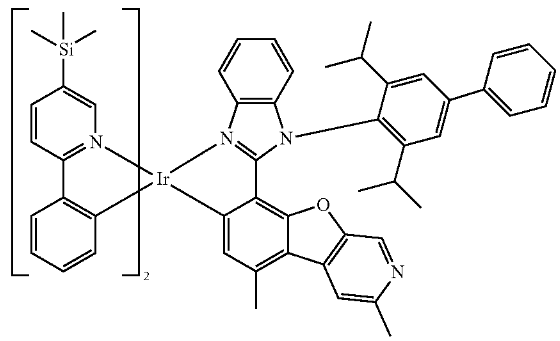
325
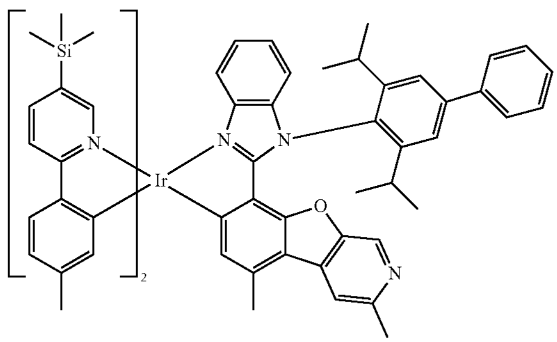
326
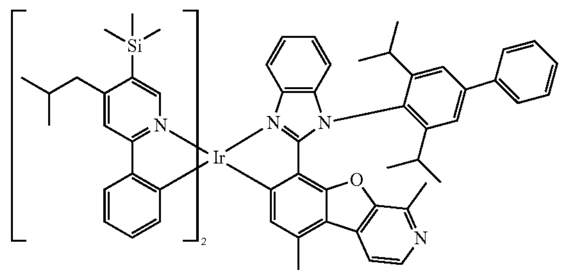
327
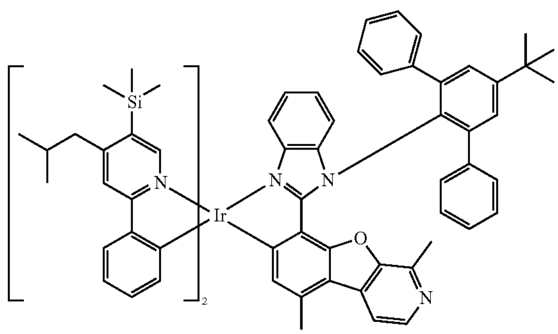
328
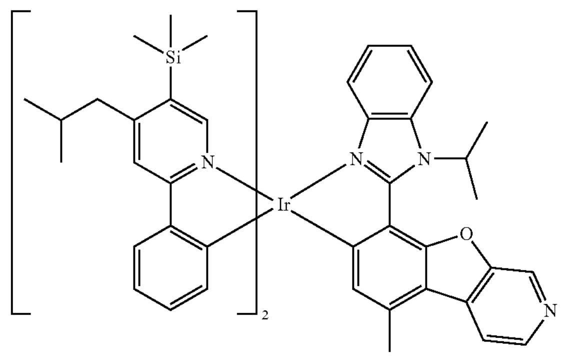
329
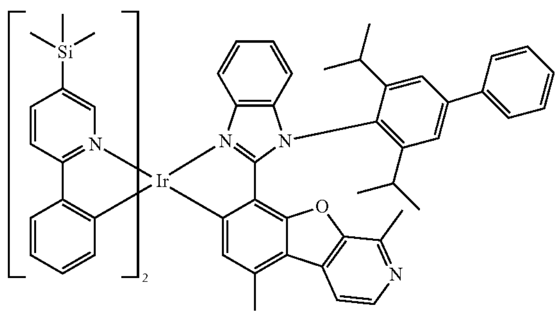
330
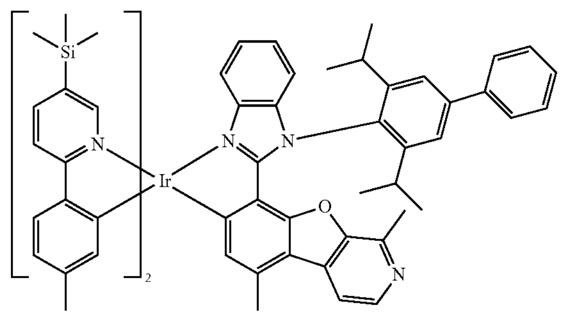

-continued
331
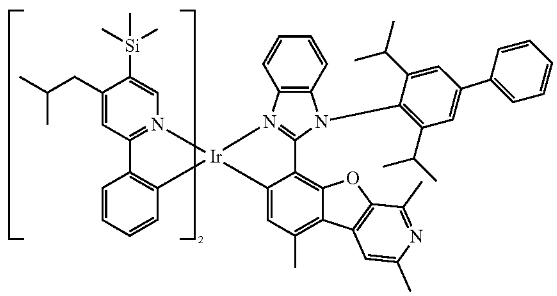
332
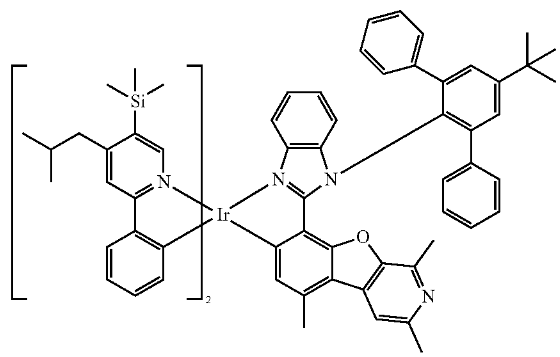
333
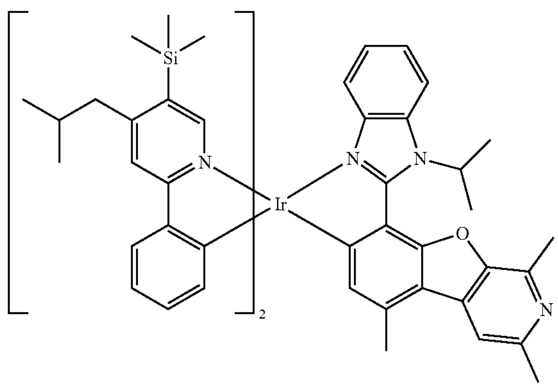
334
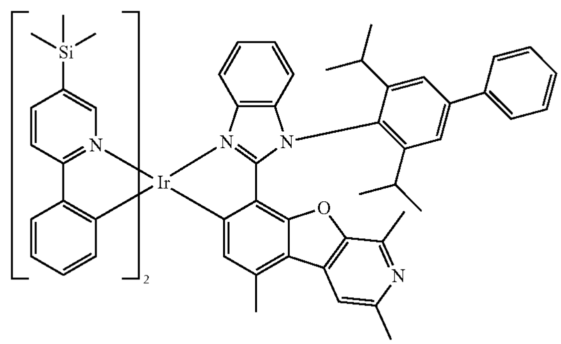
335
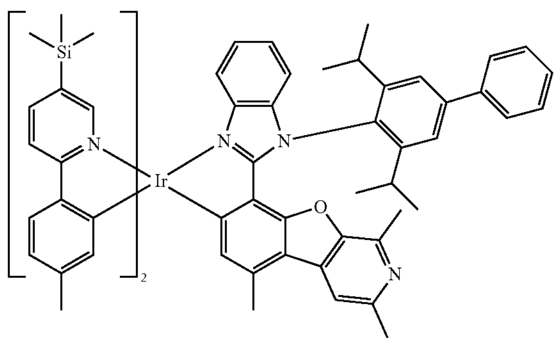
336
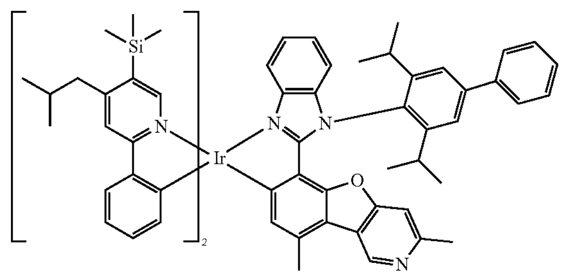
337
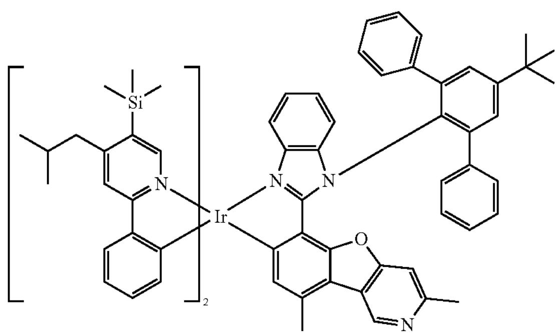
338
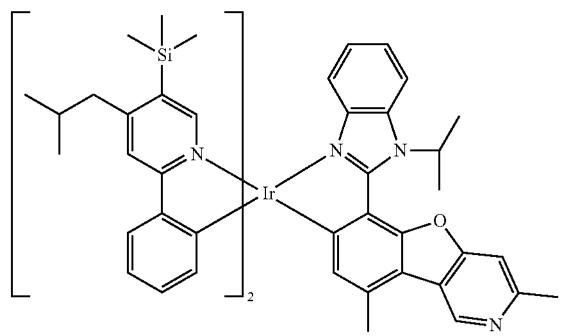

-continued
339
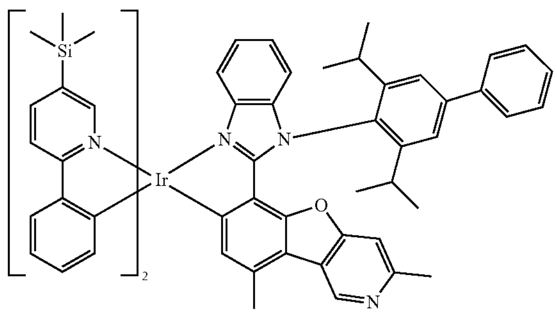
340
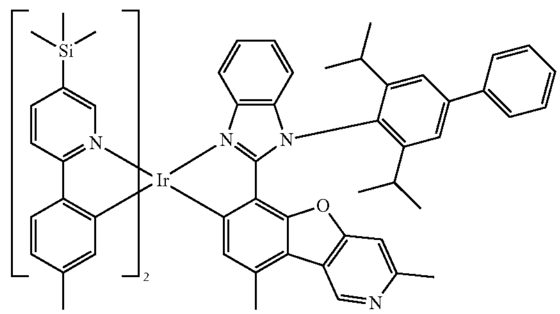
341
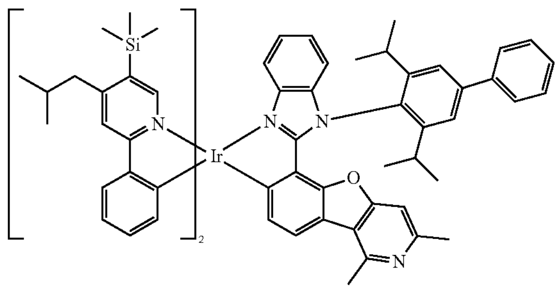
342
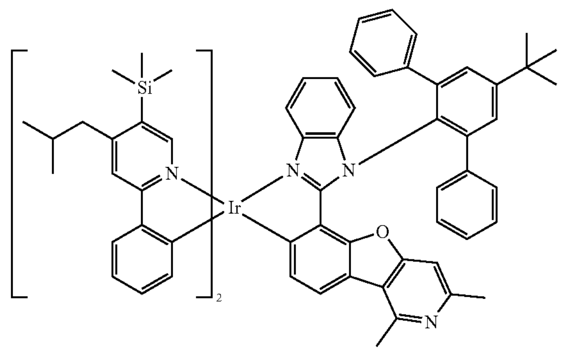
343
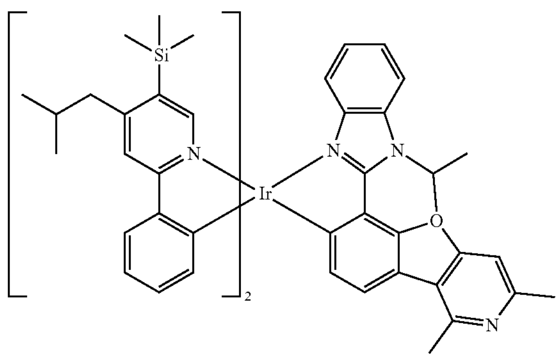
344
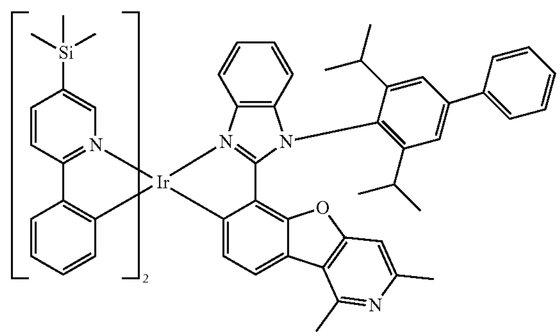
345
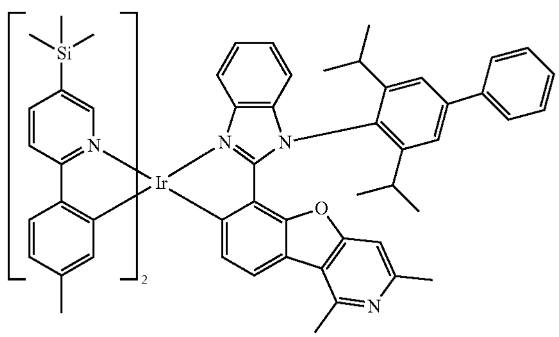
346
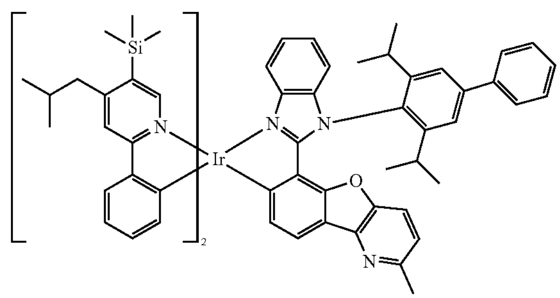

-continued
347
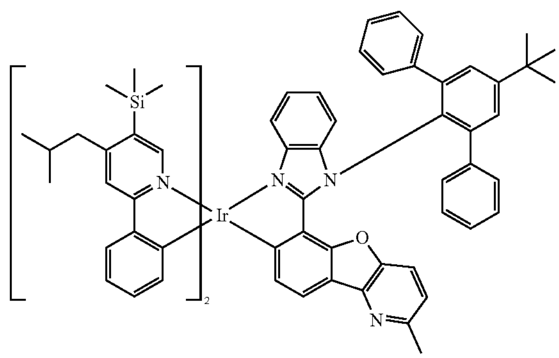
348
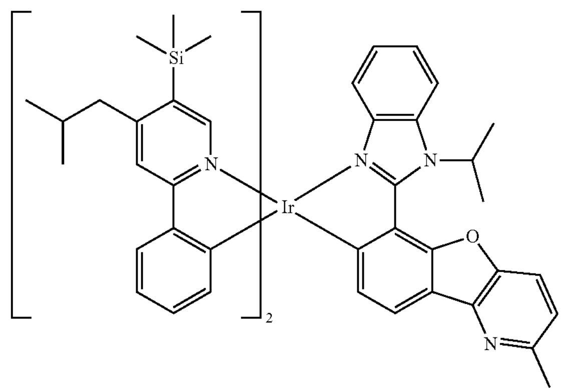
349
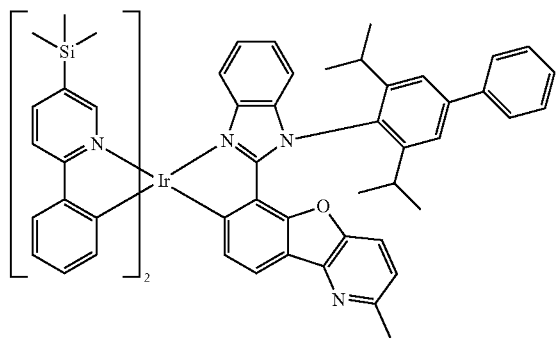
350
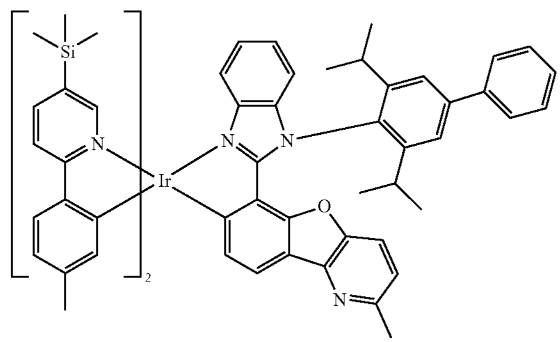
351
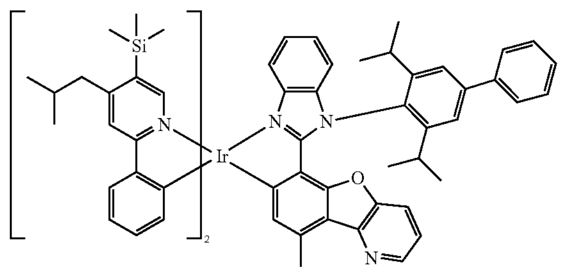
352
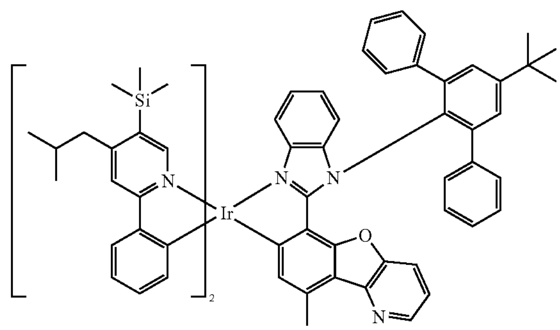
353
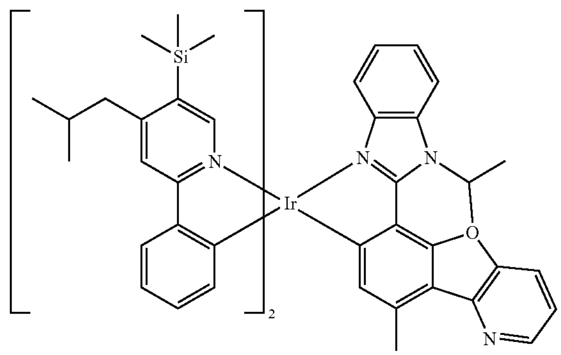
354
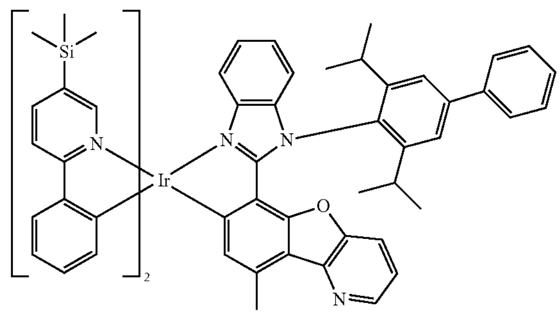

-continued
355
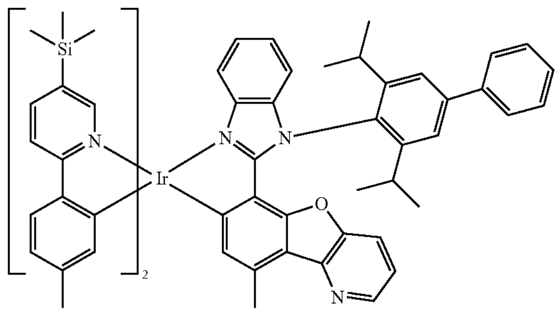
356
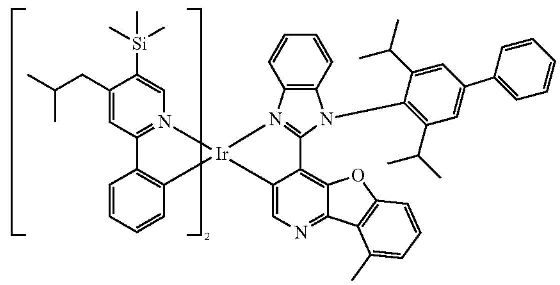
357
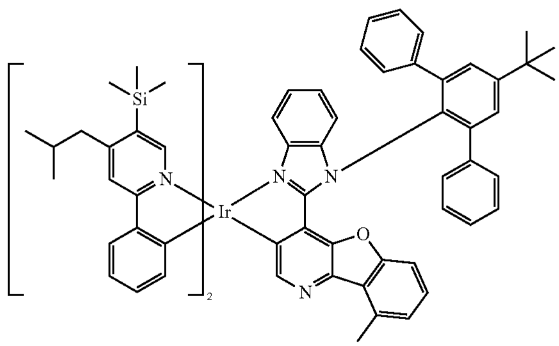
358
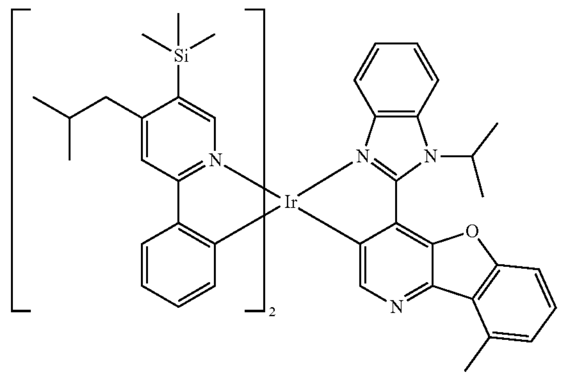
359
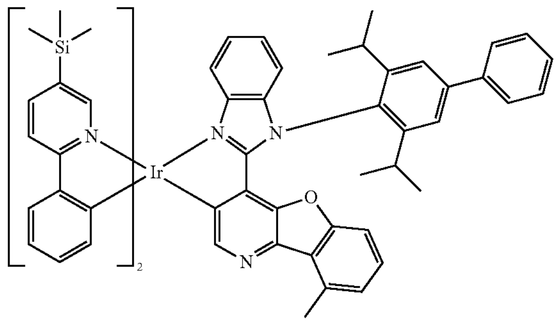
360
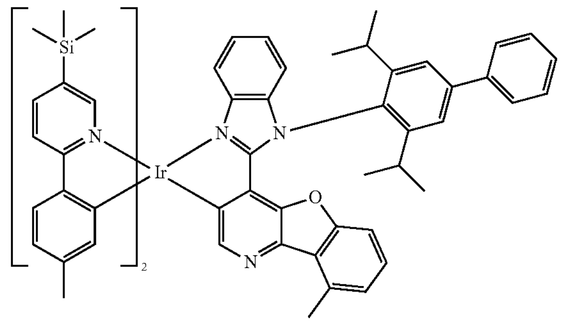
361
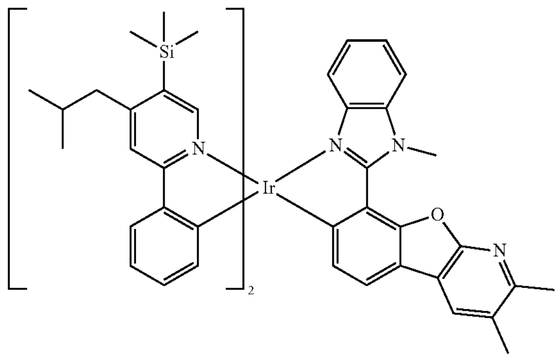
362
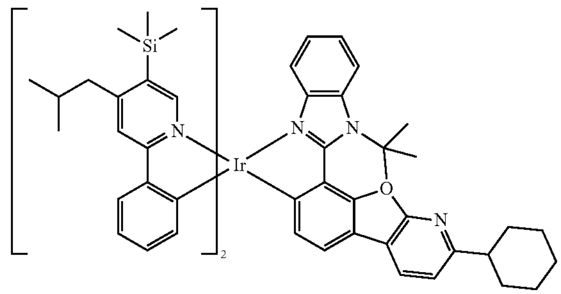

-continued
363
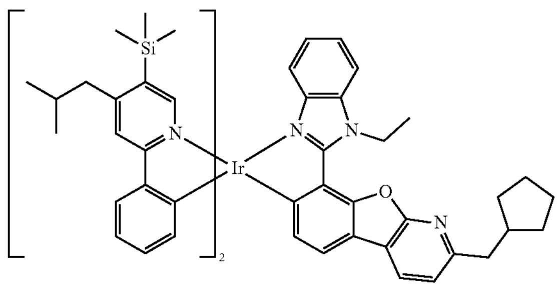
364
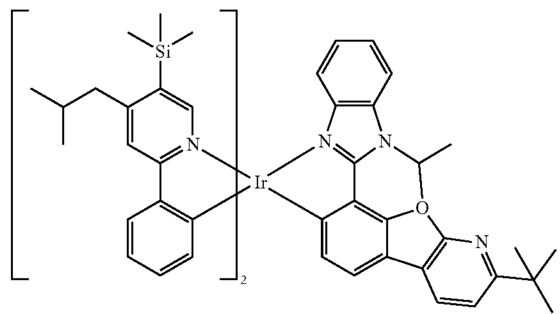
365
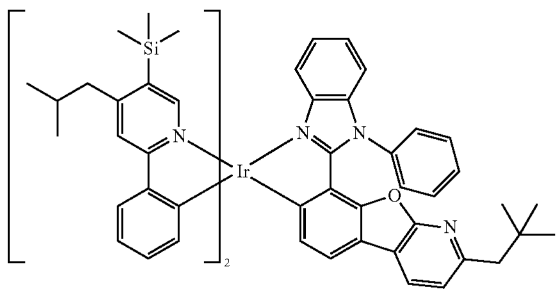
366
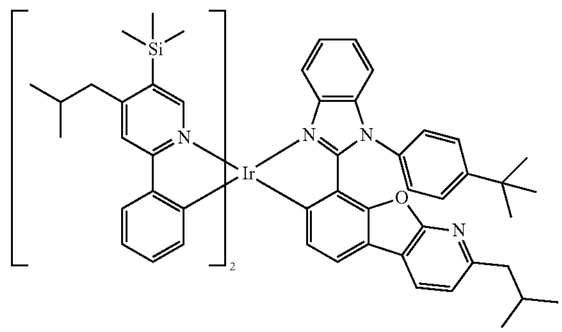
367
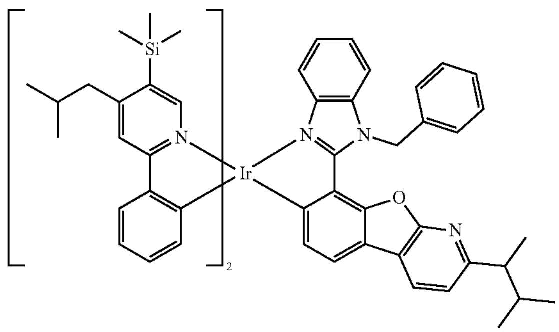
368
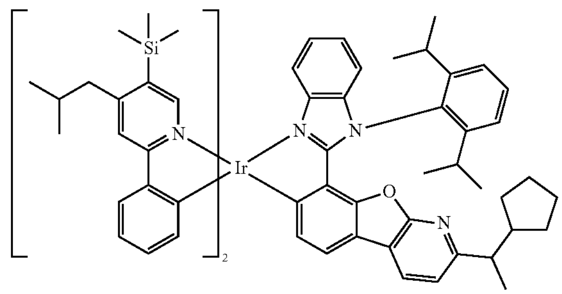
369
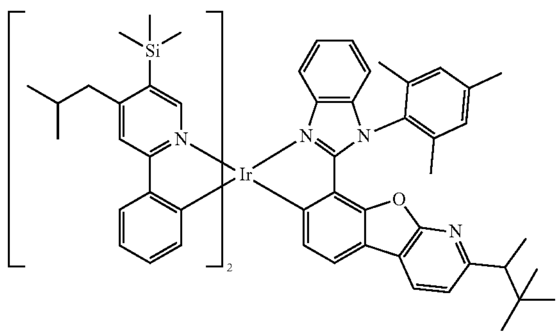
370
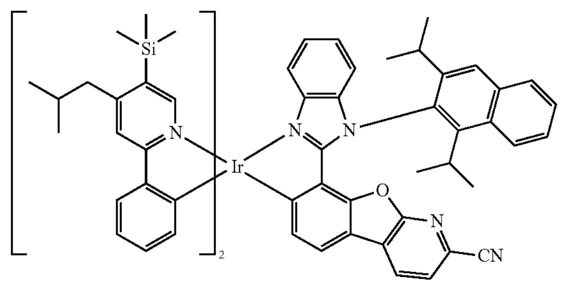

-continued
371
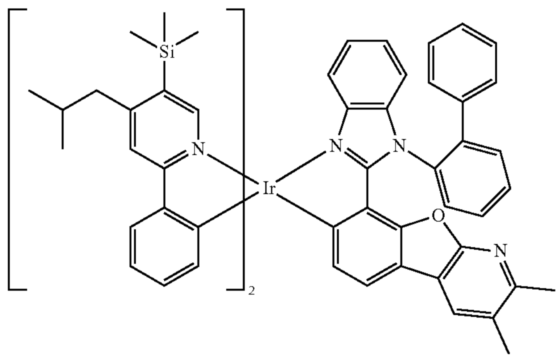
372
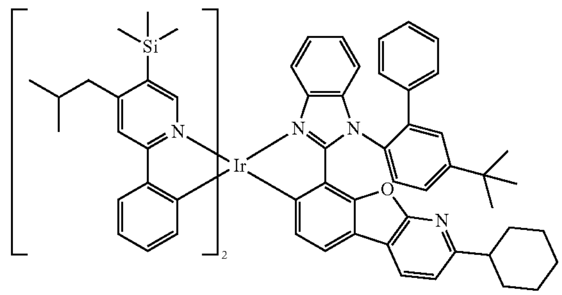
373
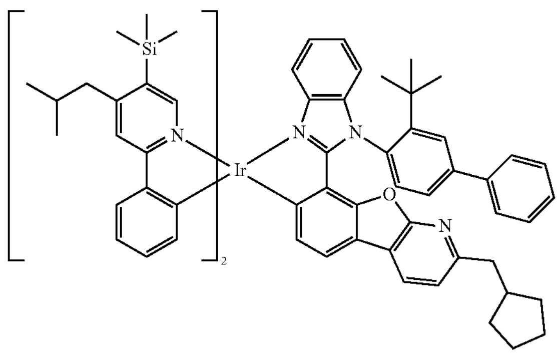
374
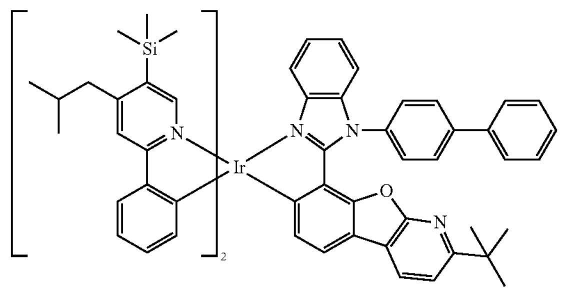
375
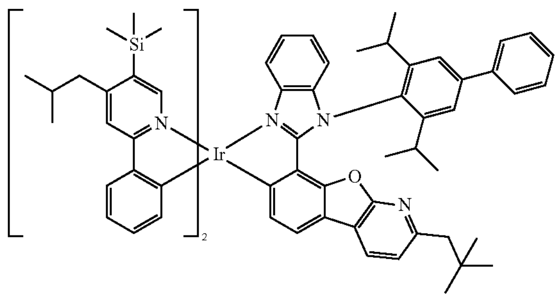
376
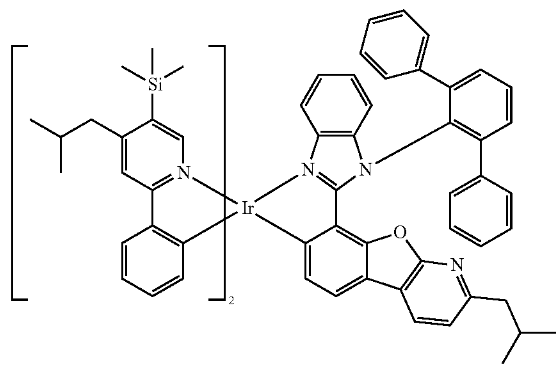
377
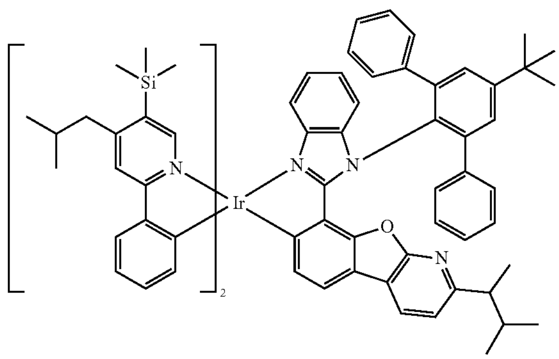
378
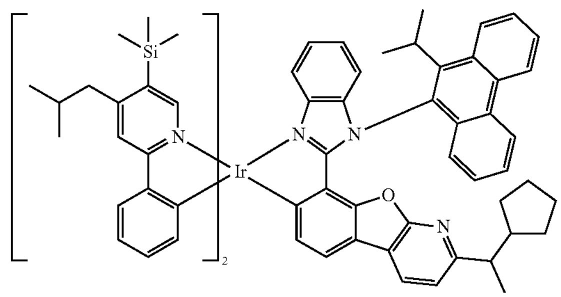

-continued
379
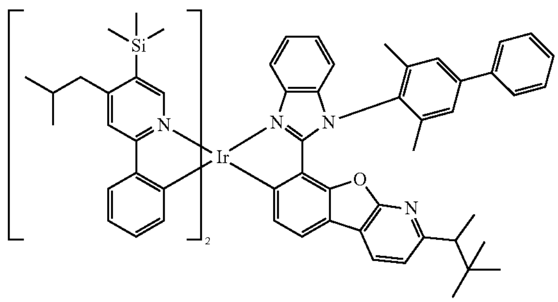
380
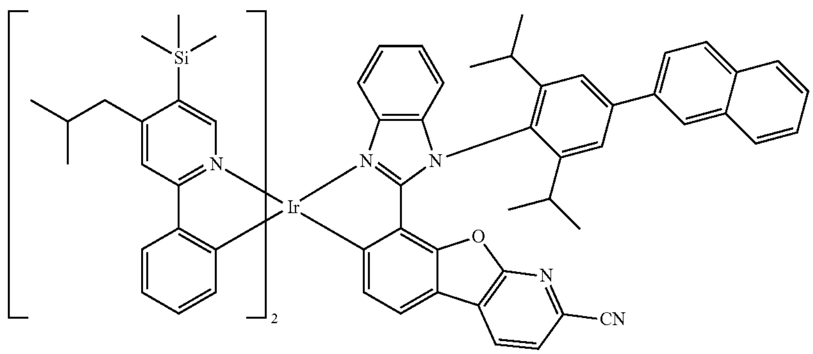
381
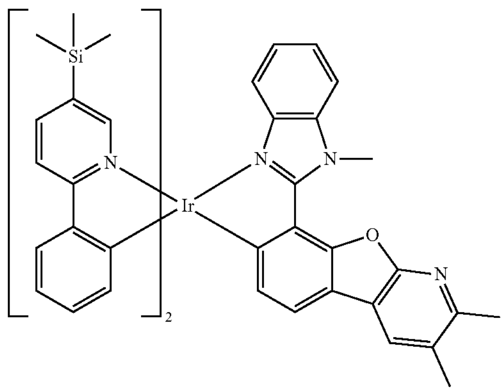
382
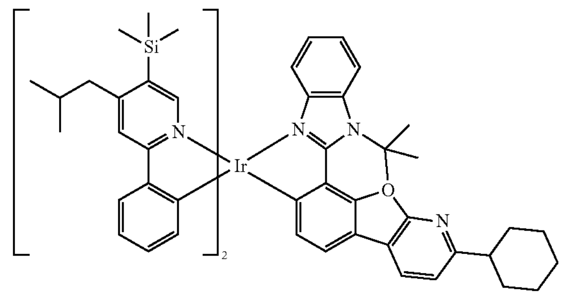
383
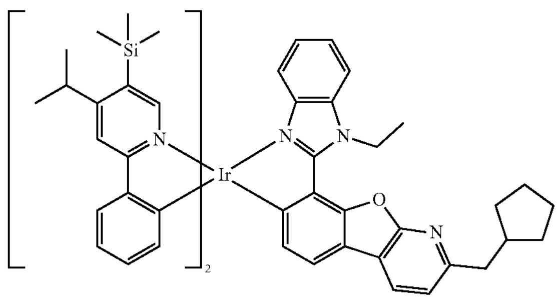
384
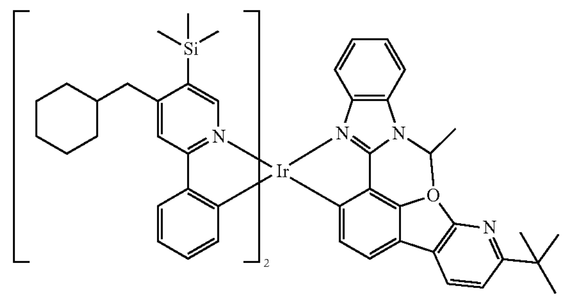

-continued
385
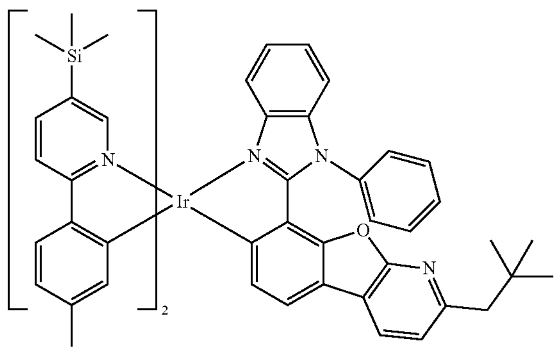
386
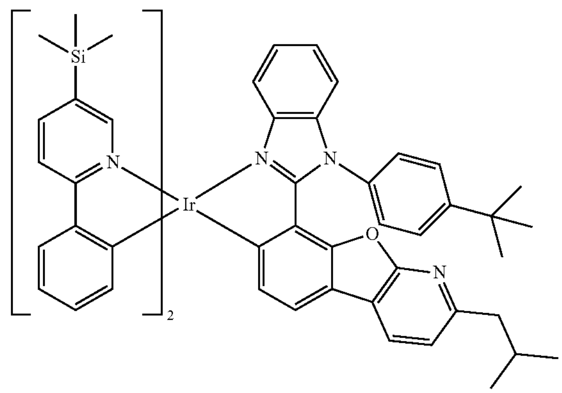
387
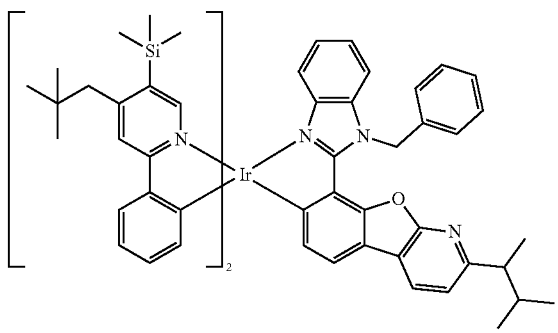
388
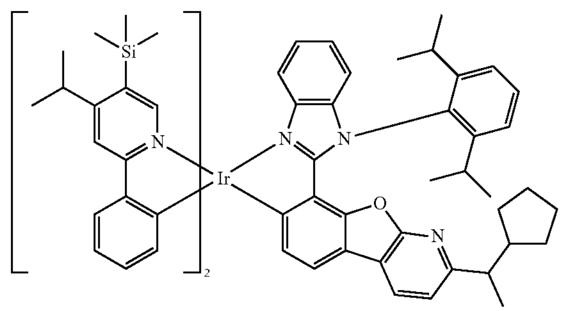
389
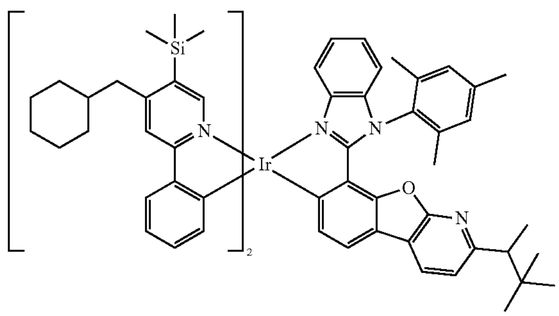
390
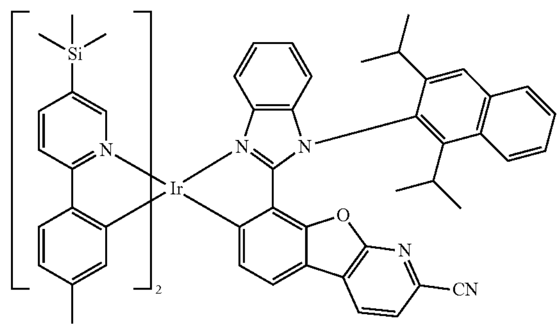
391
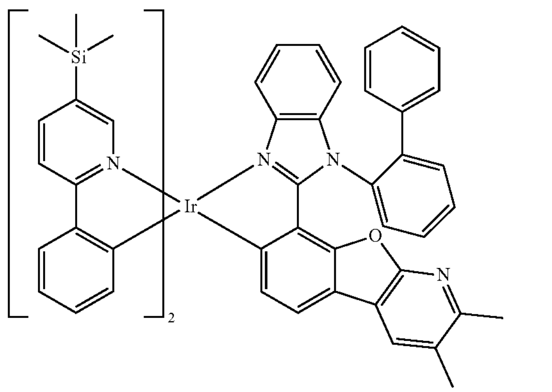
392
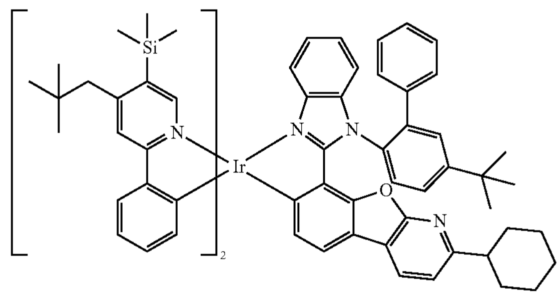

-continued
393
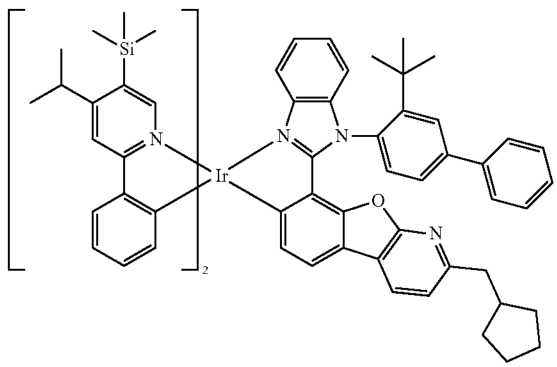
394
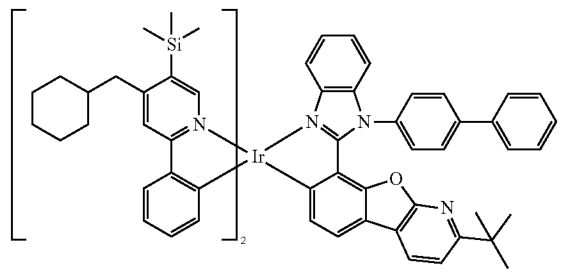
395
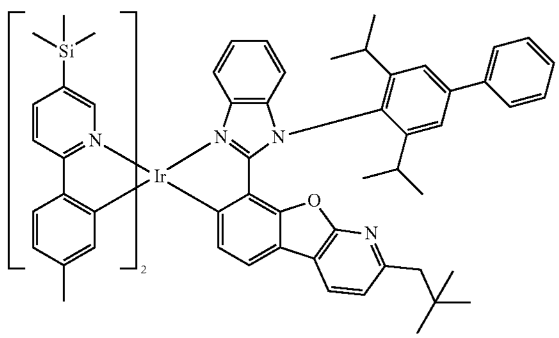
396
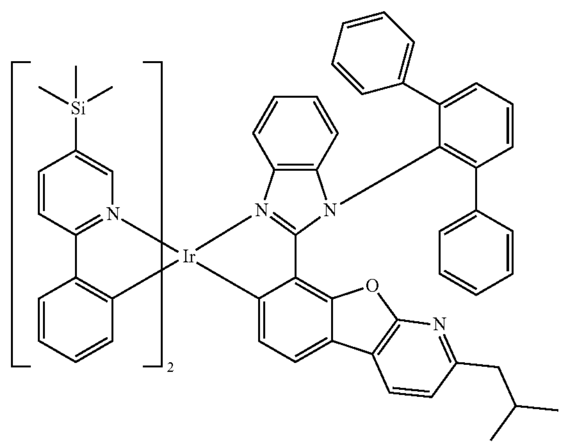
397
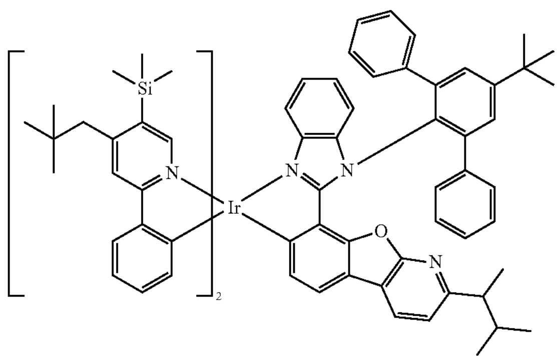
398
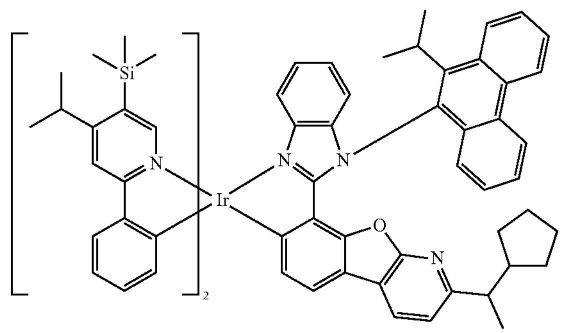
399
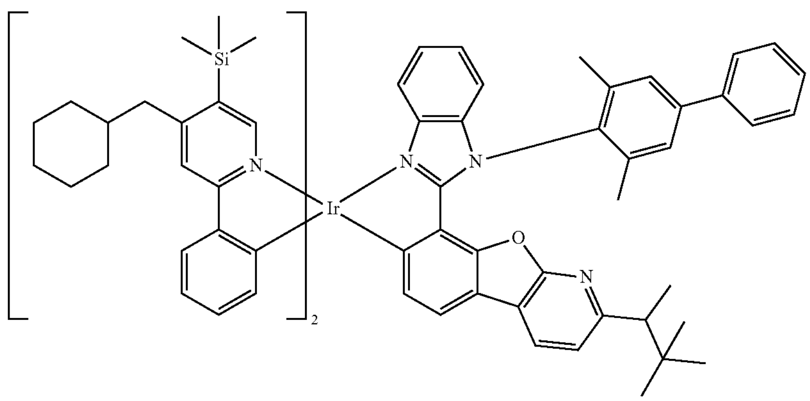

-continued
400
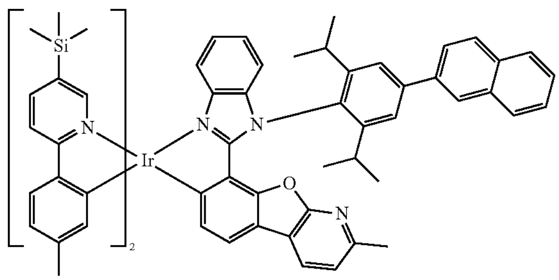
401
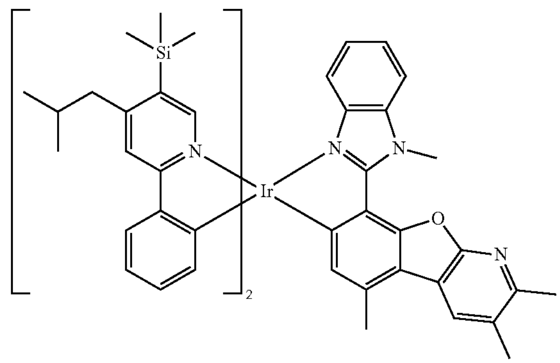
402
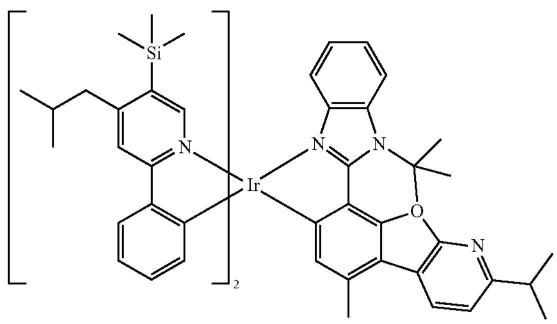
403
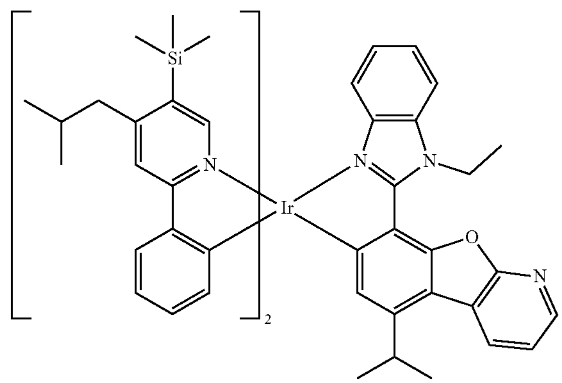
404
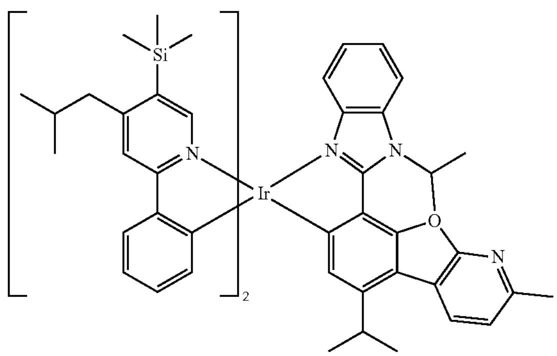
405
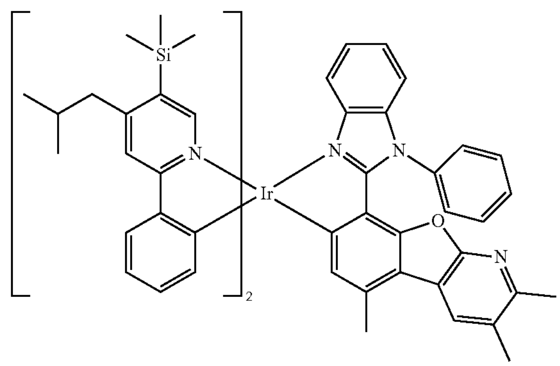
406
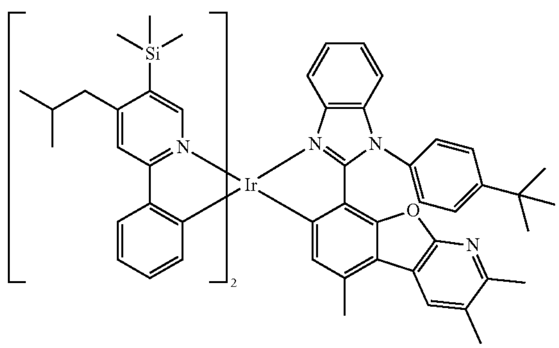
407
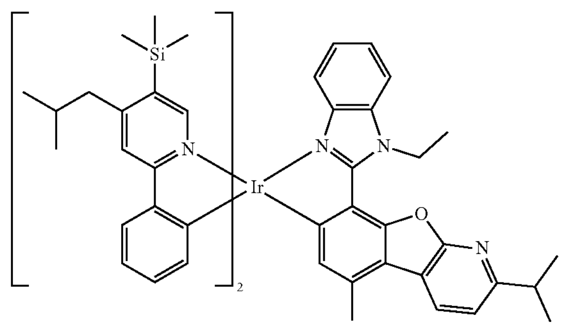

-continued
408
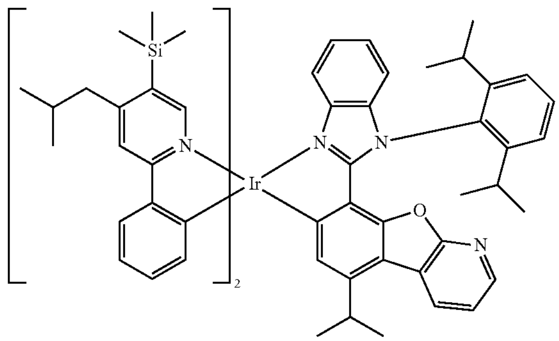
409
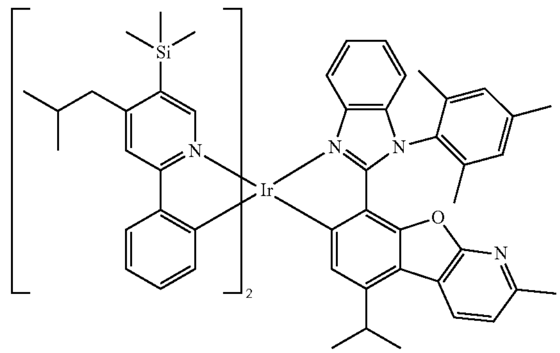
410
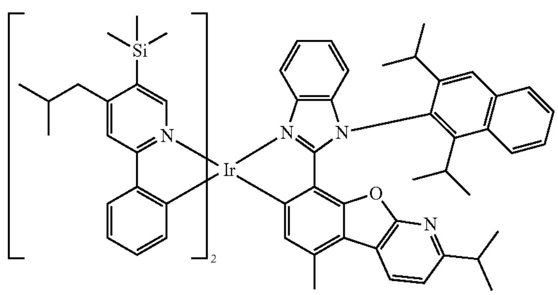
411
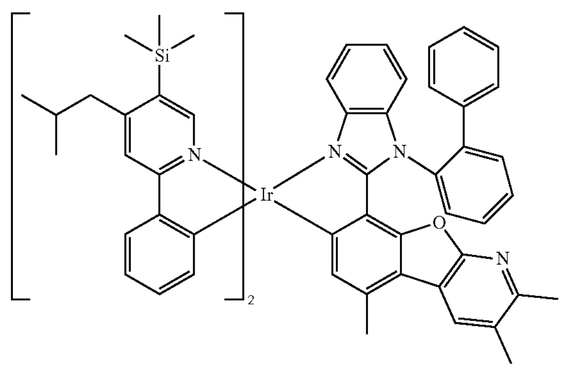
412
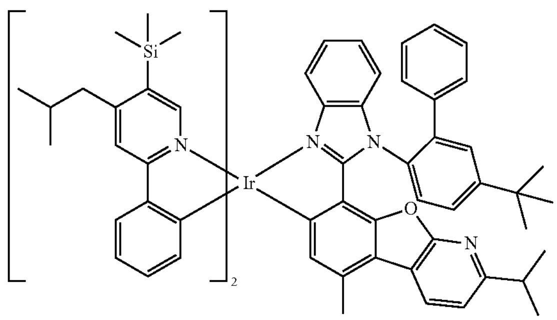
413
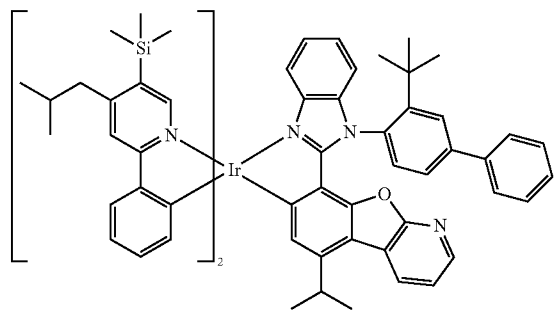
414
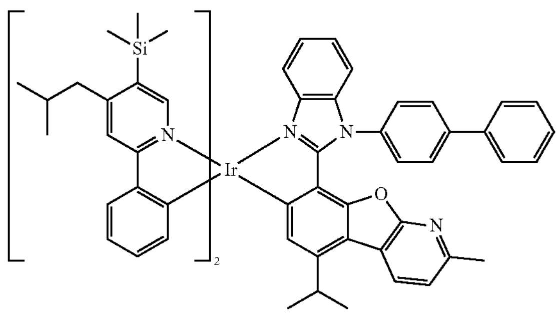
415
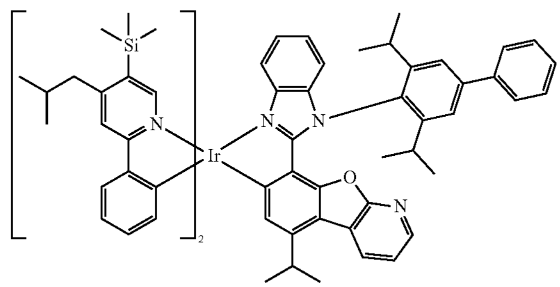

-continued
416
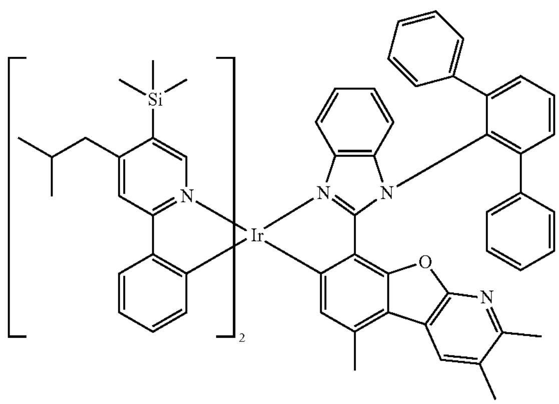
417
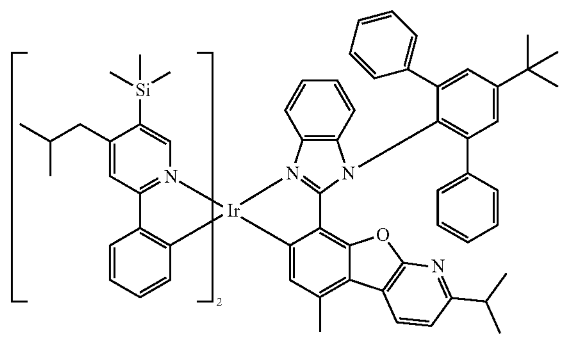
418
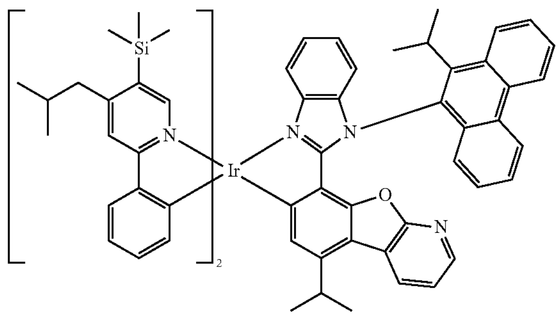
419
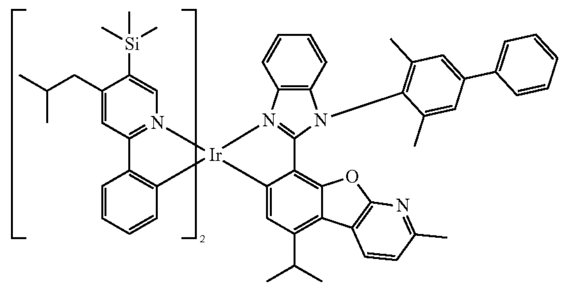
420
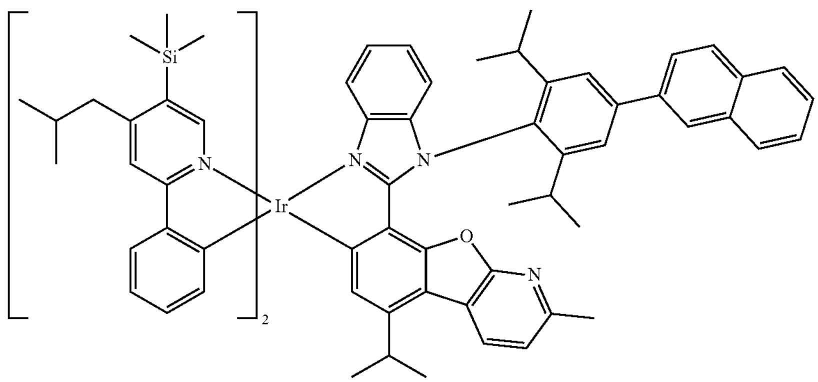
421
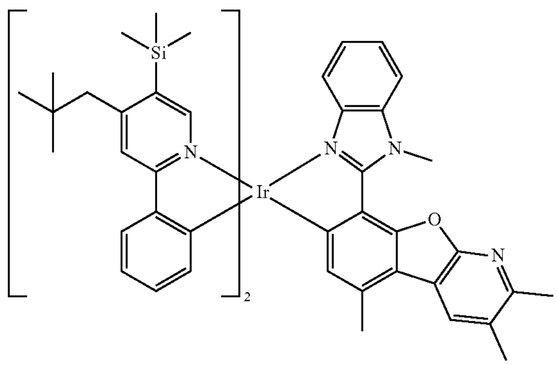
422
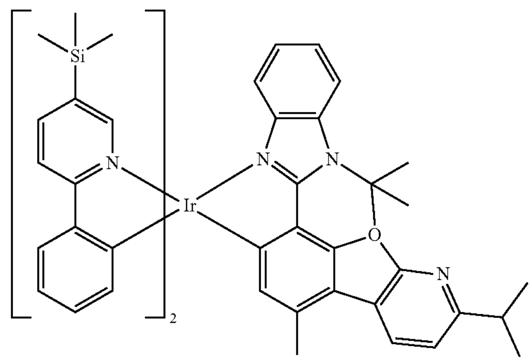

-continued
423
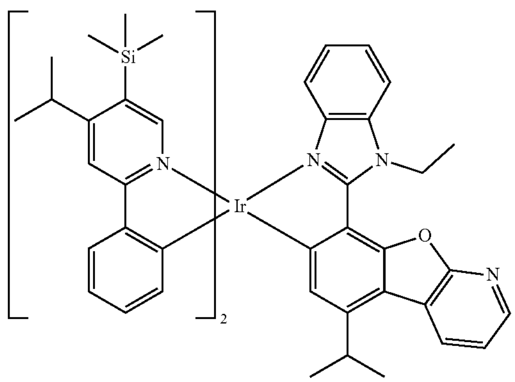
424
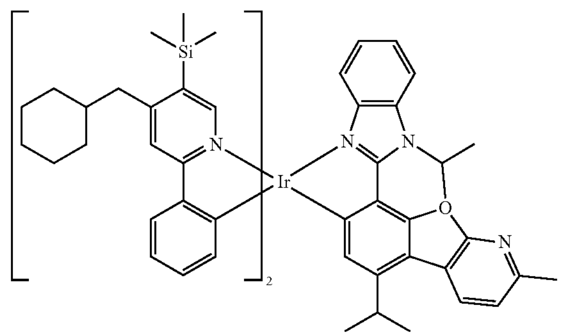
425
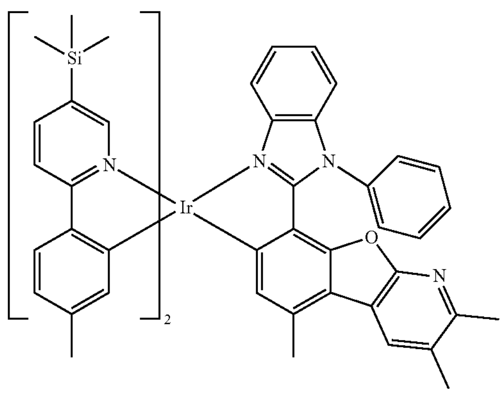
426
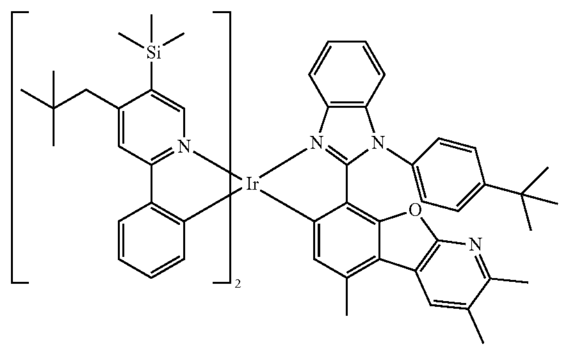
427
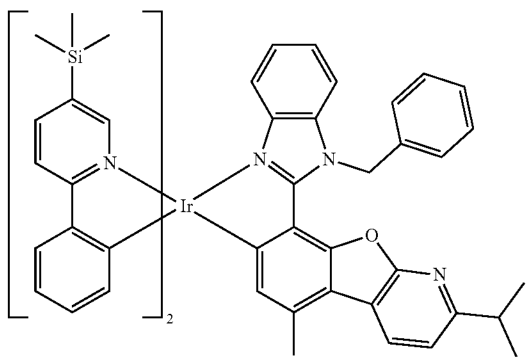
428
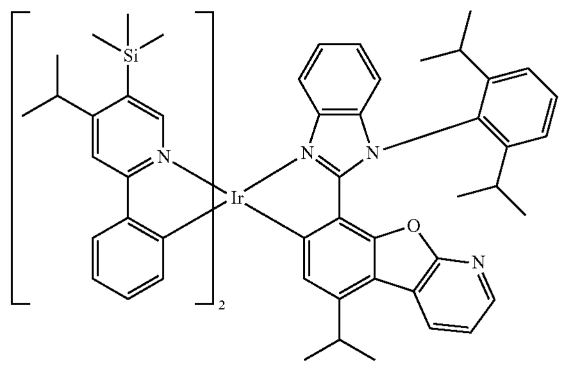
429
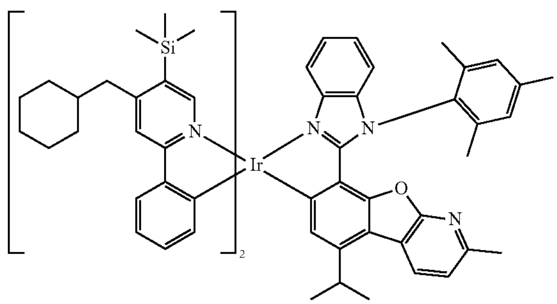
430
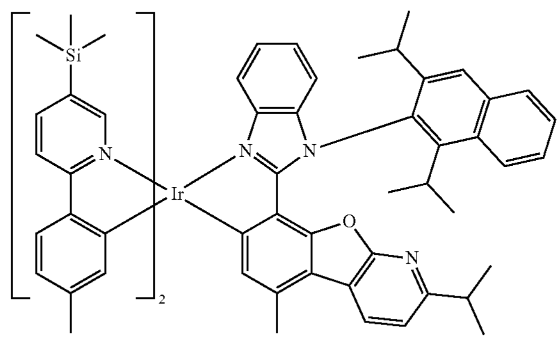

-continued
431
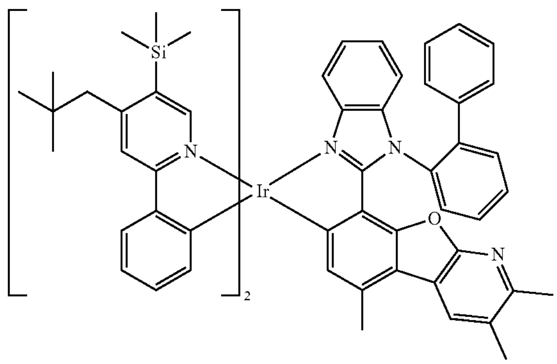
432
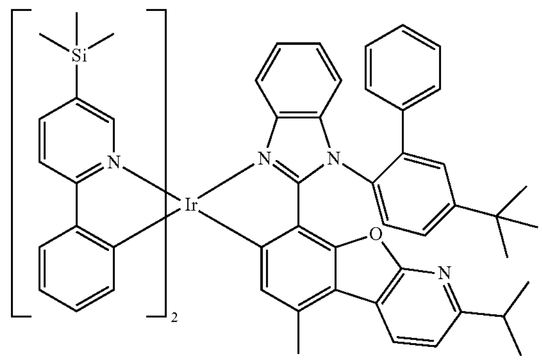
433
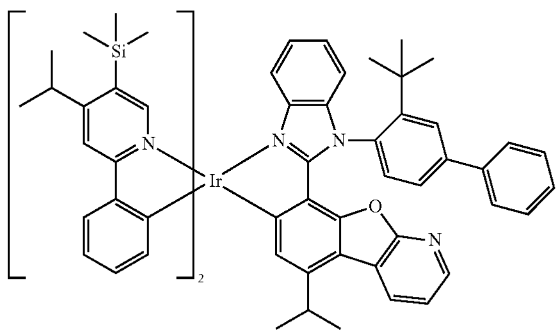
434
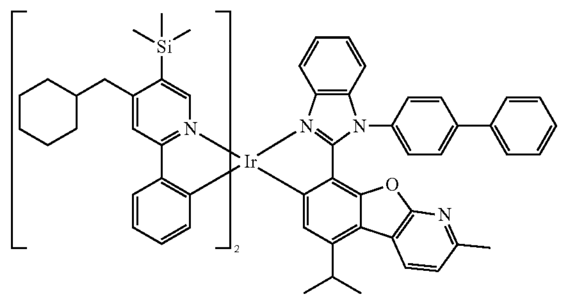
435
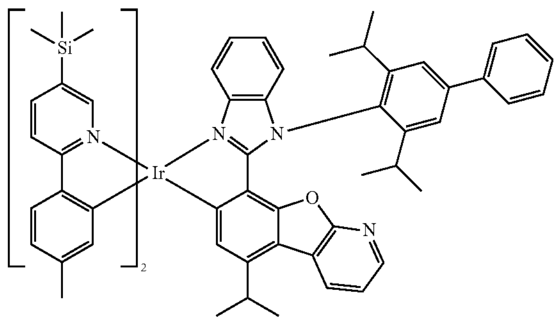
436
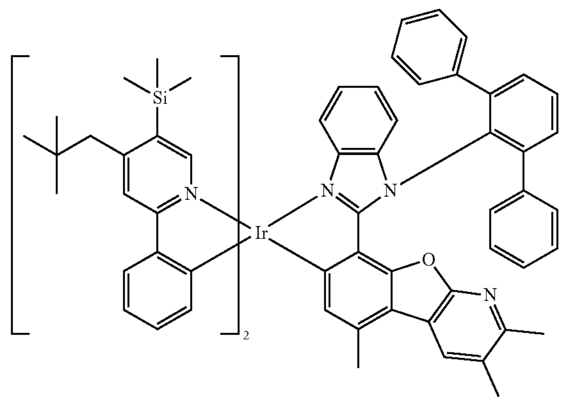
437
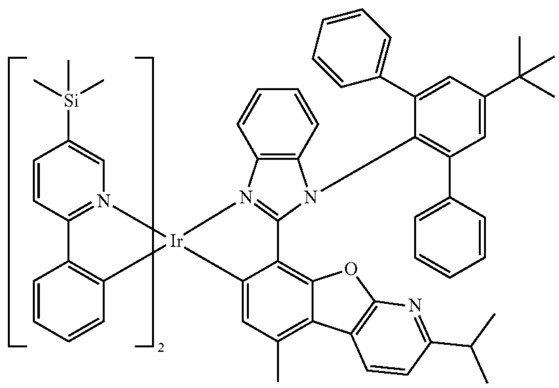
438
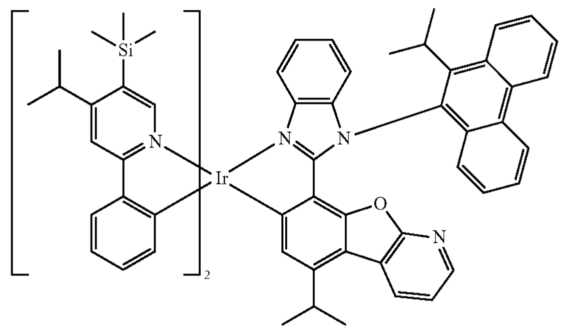

-continued
439
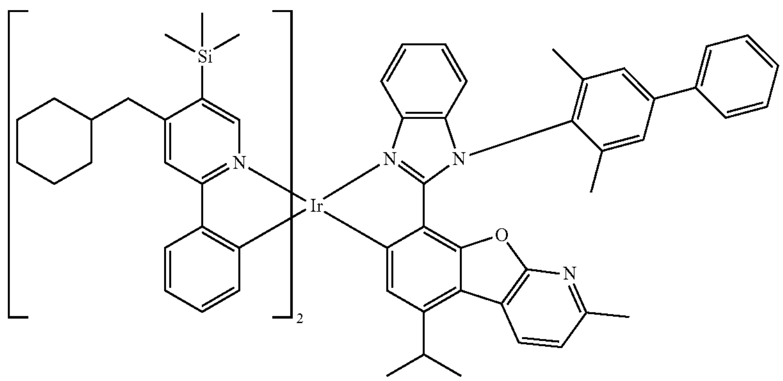
440
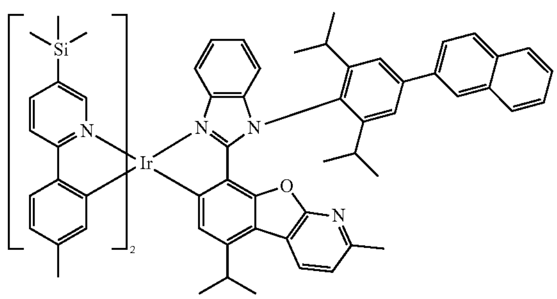
441
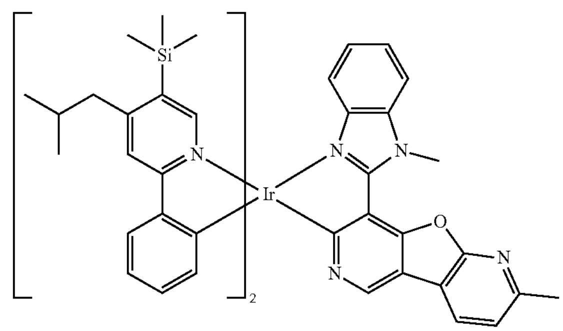
442
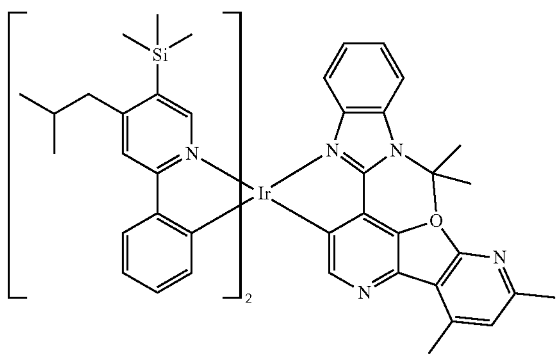
443
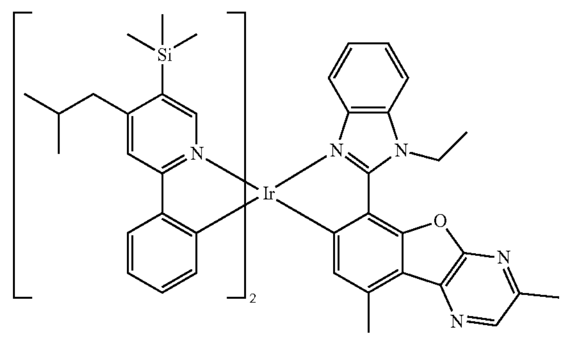
444
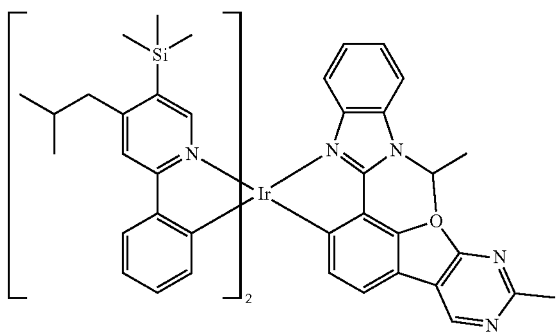
445
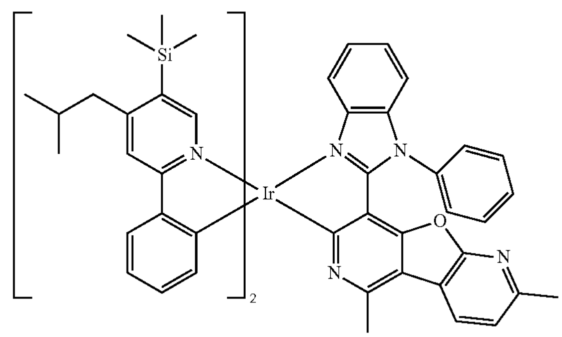

-continued
446
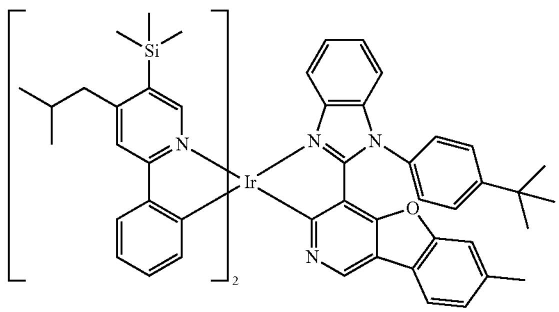
447
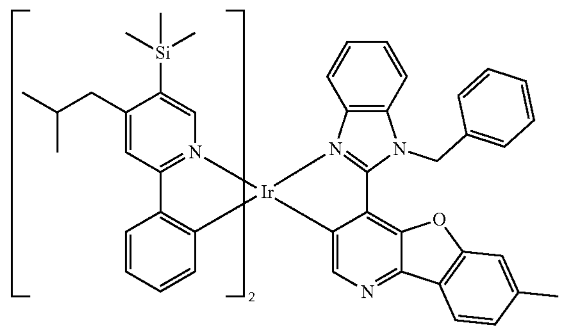
448
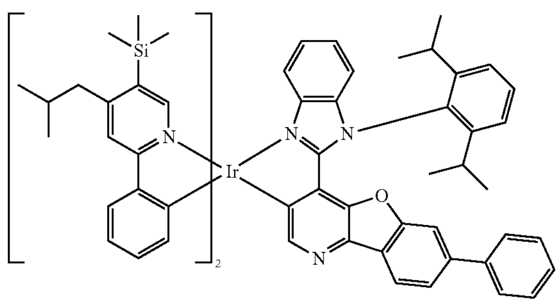
449
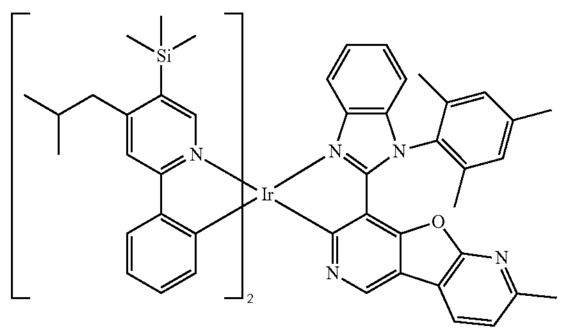
450
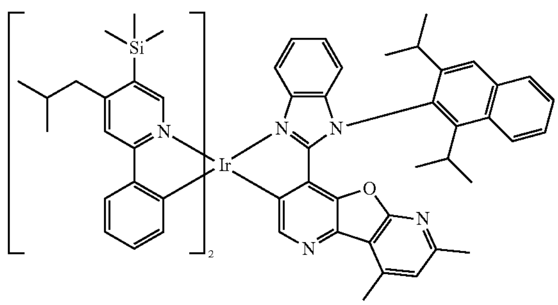
451
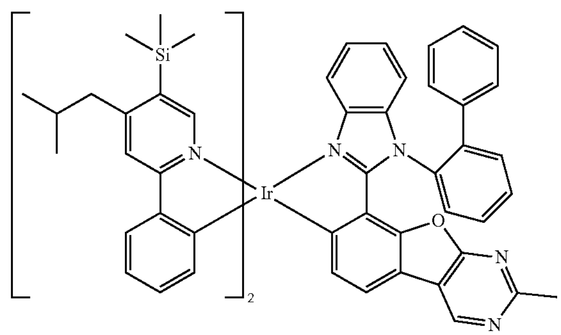
452
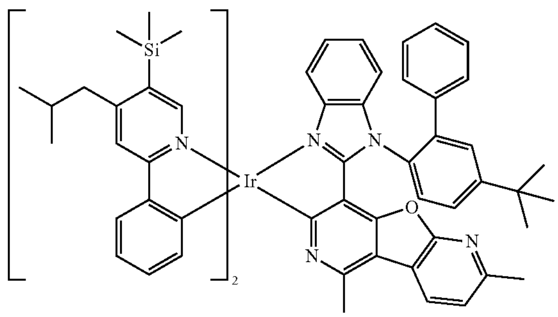
453
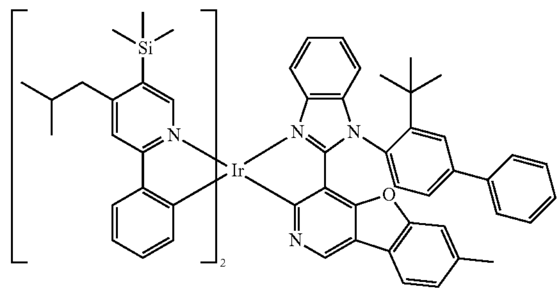

-continued
454
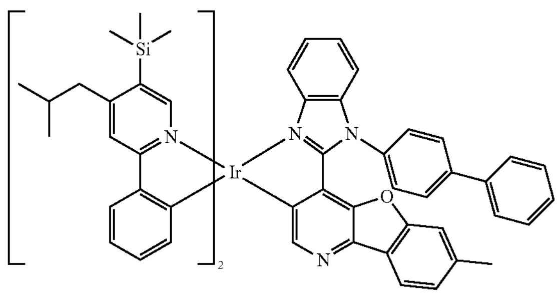
455
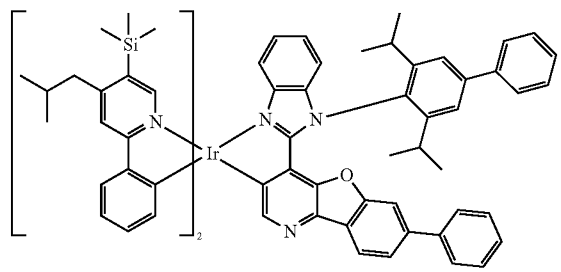
456
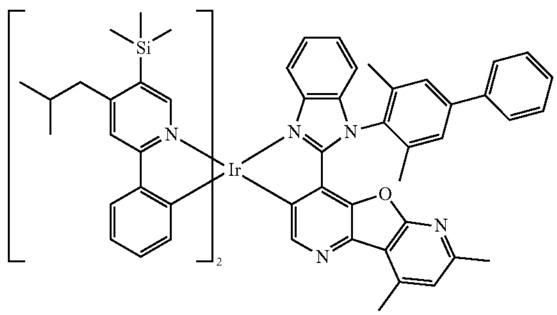
457
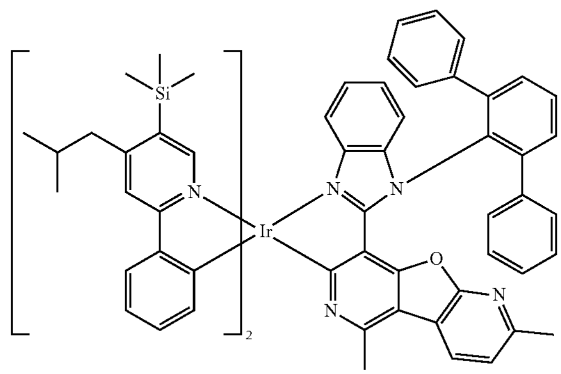
458
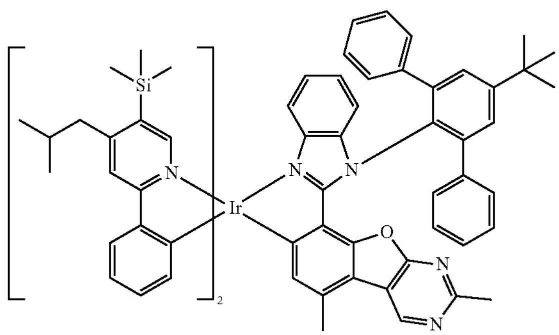
459
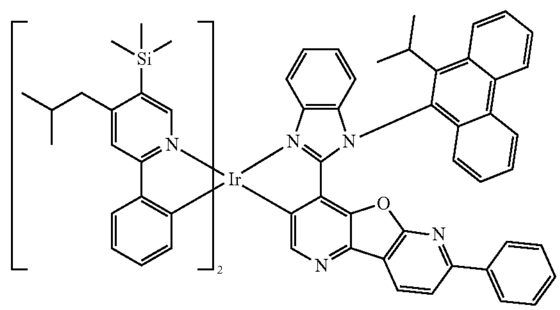
460
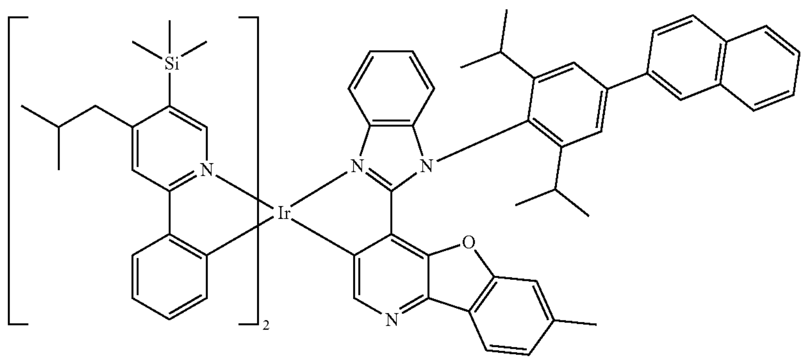

-continued
461
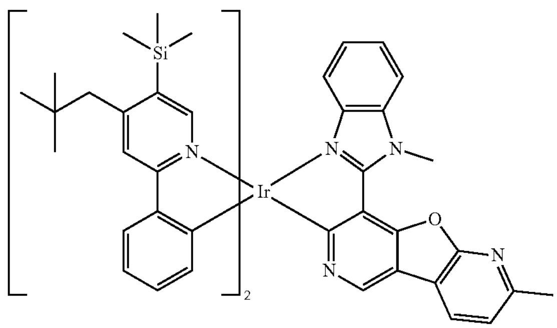
462
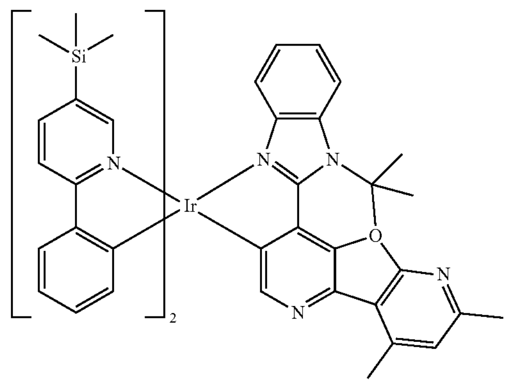
463
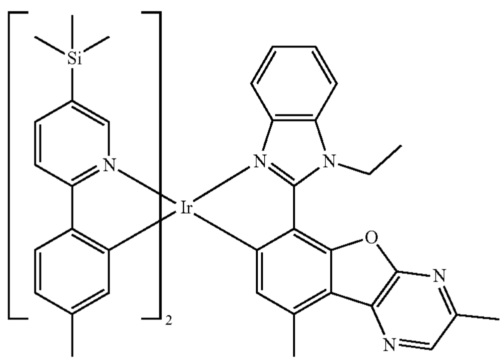
464
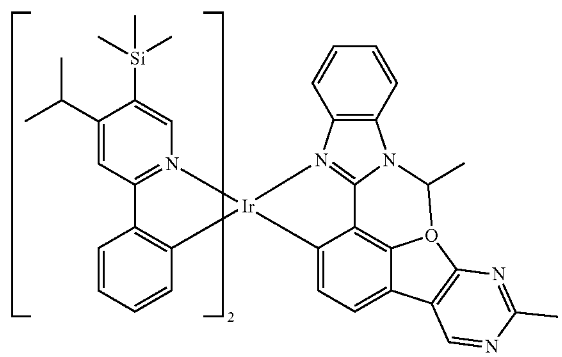
465
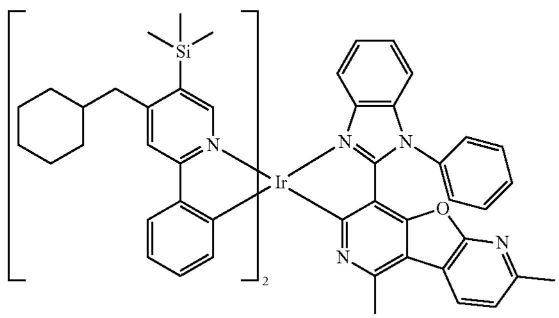
466
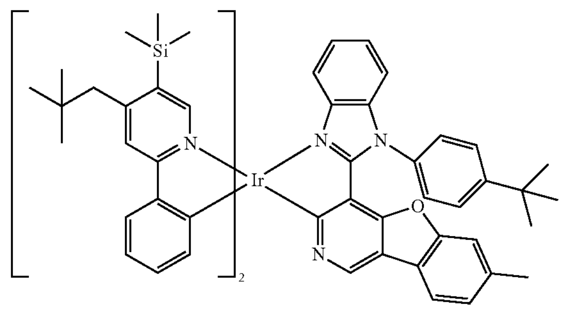
467
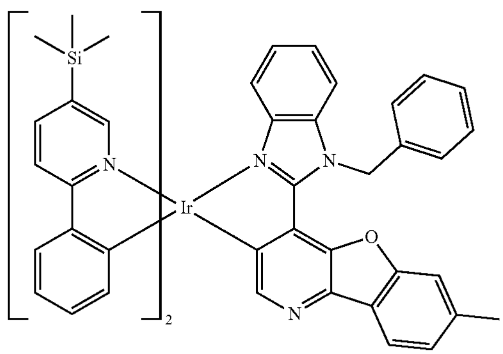
468
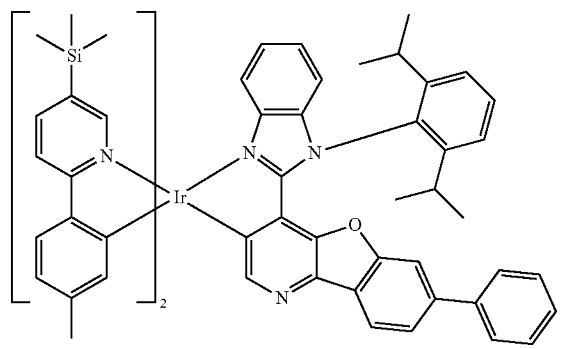

-continued
469
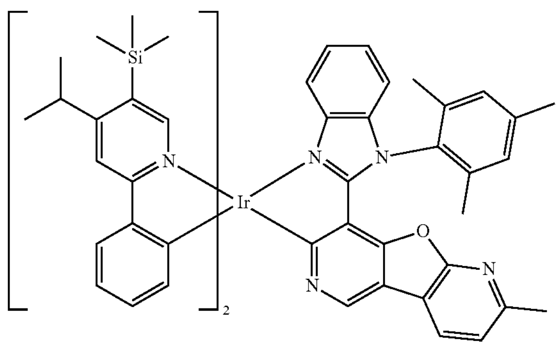
470
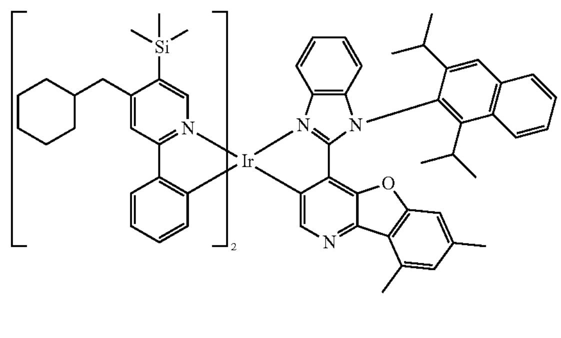
471
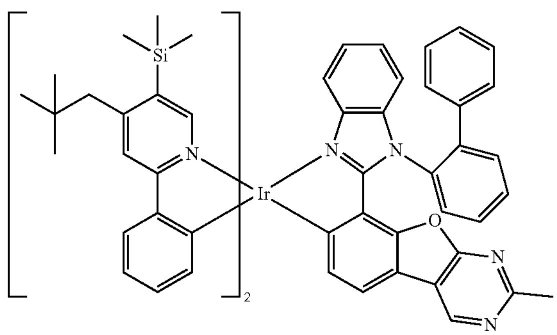
472
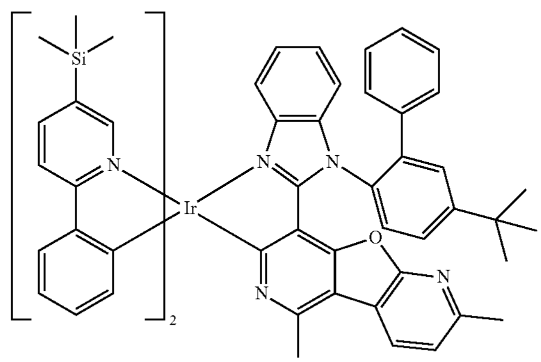
473
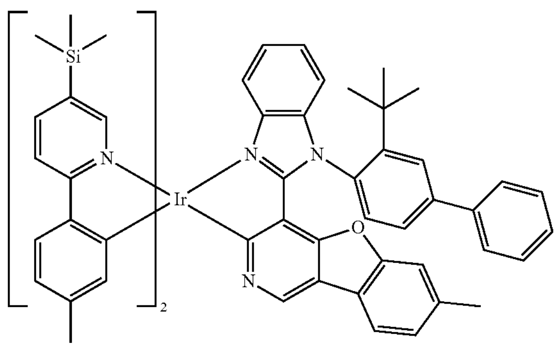
474
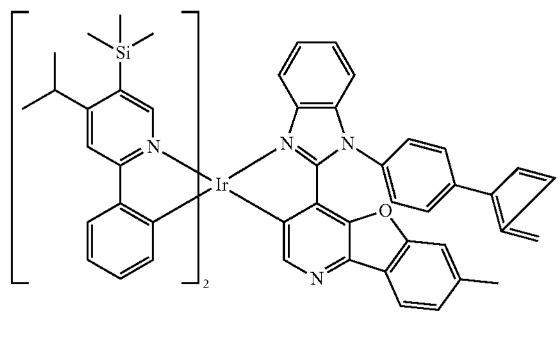
475
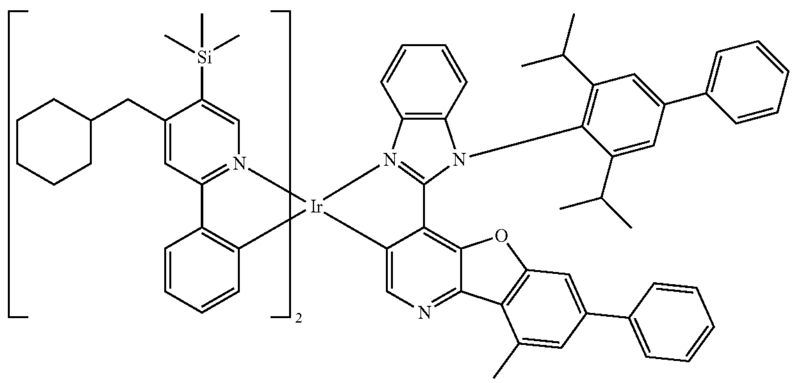

-continued
476
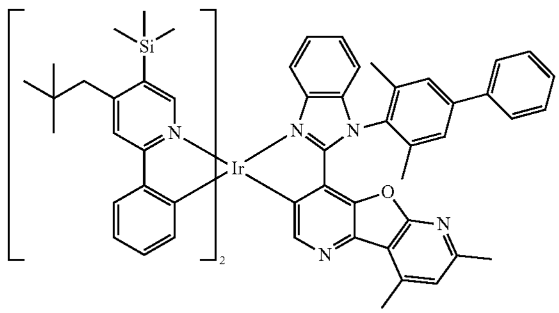
477
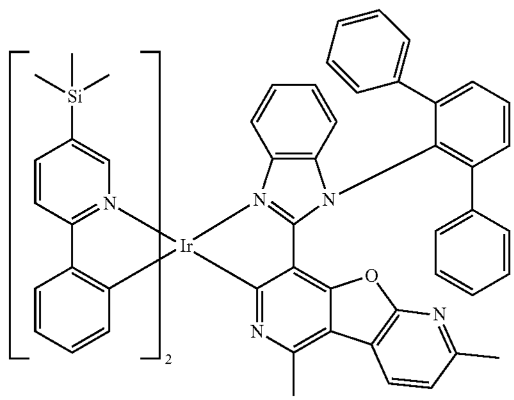
478
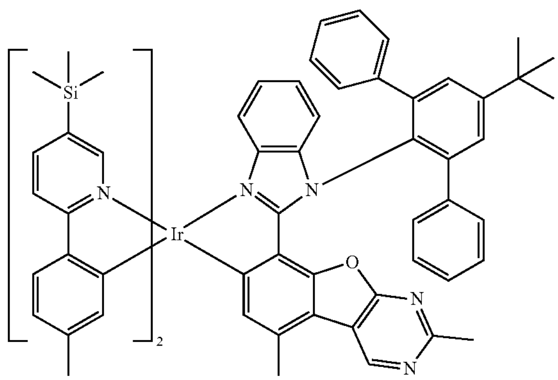
479
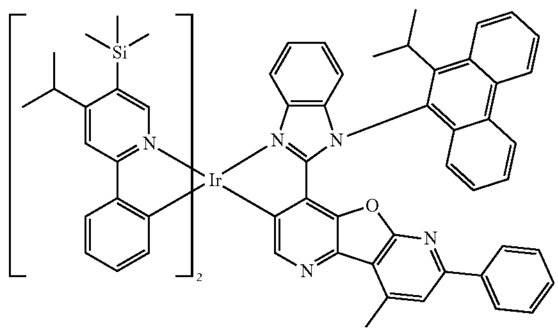
480
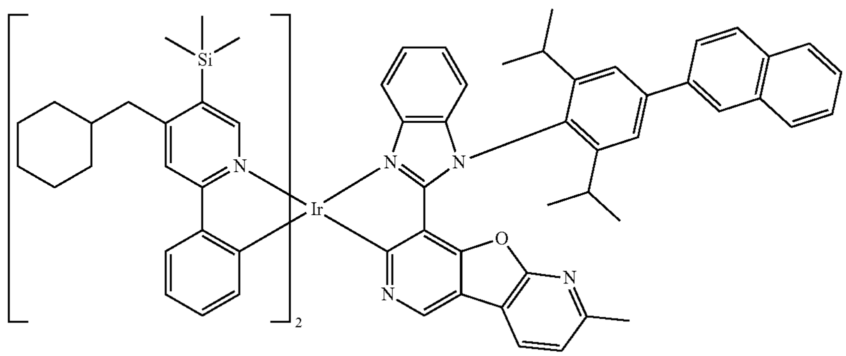
481
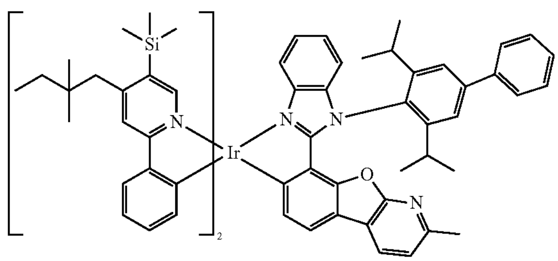
482
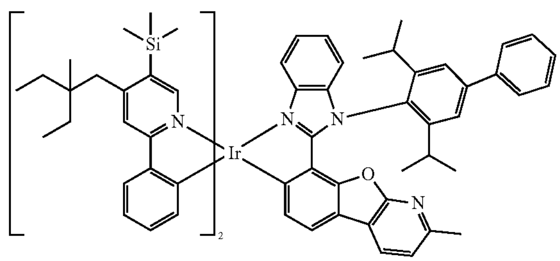

-continued
483
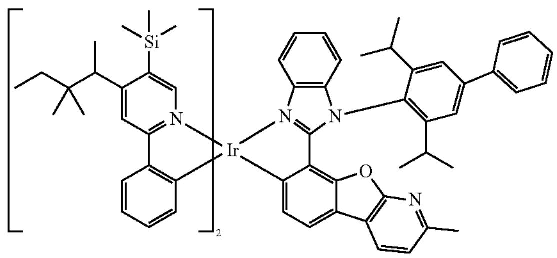
484
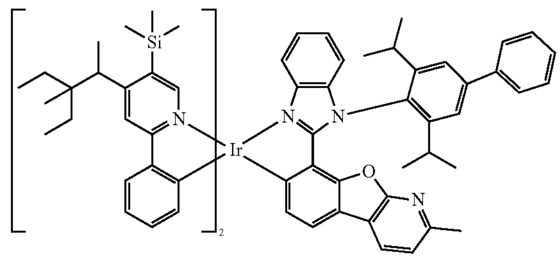
485
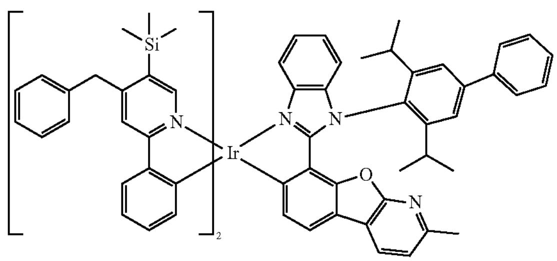
486
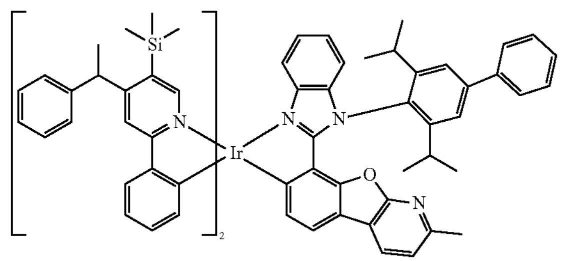
487
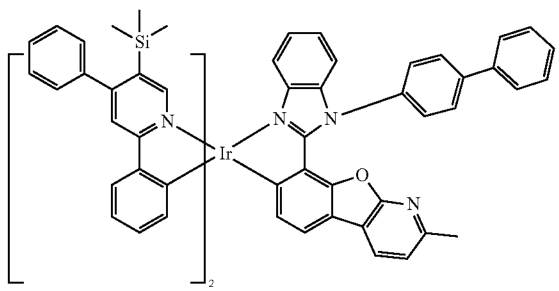
488
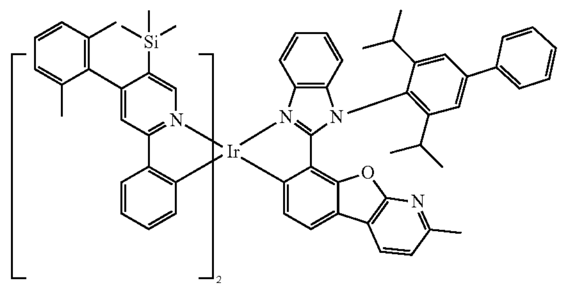
489
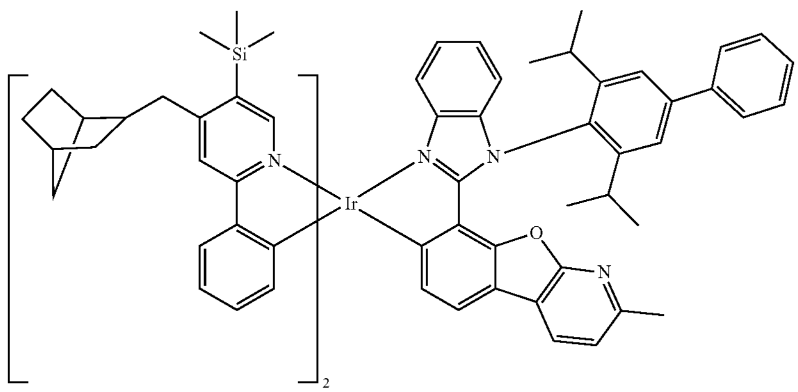
490
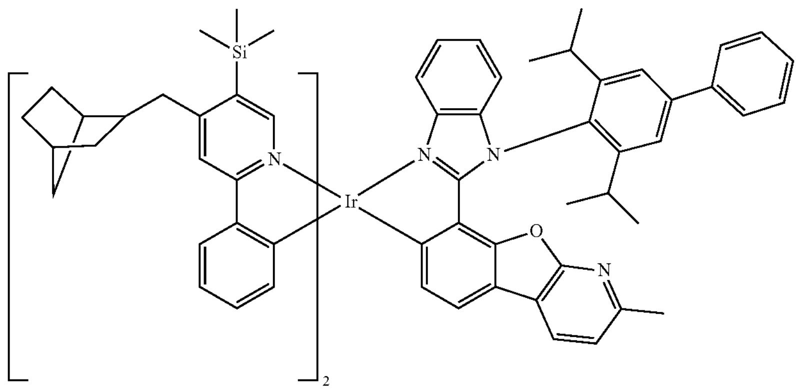

-continued
491
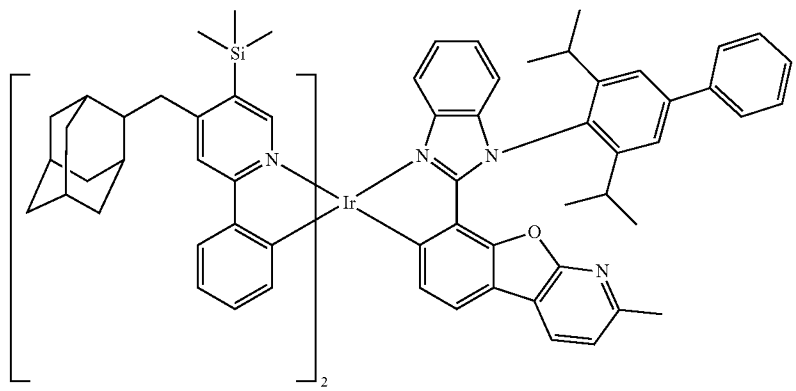
492
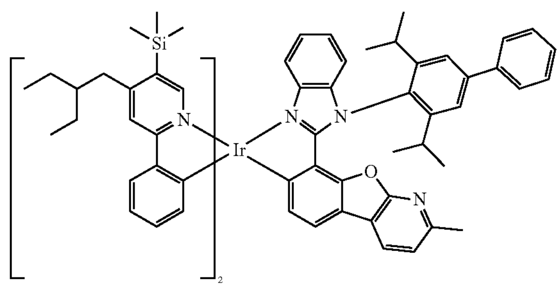
493
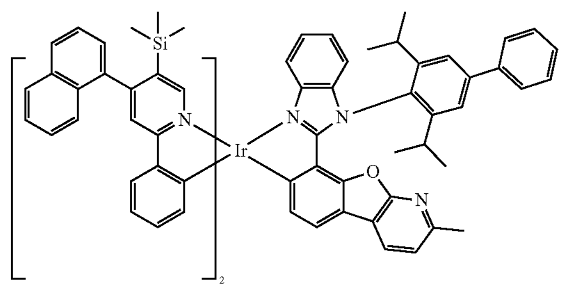
494
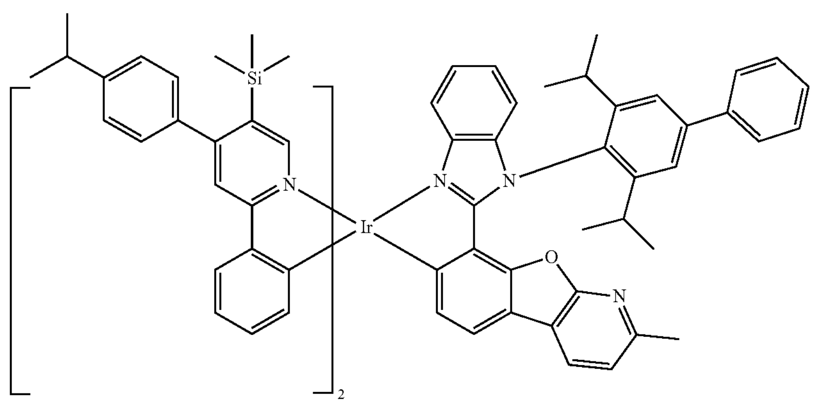
495
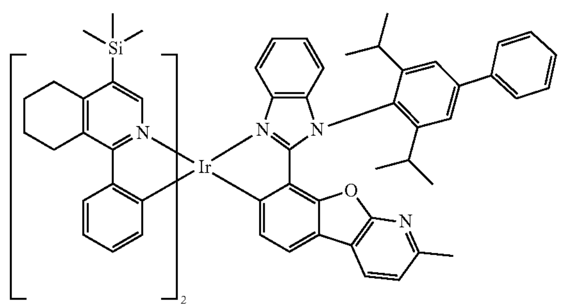

-continued
496
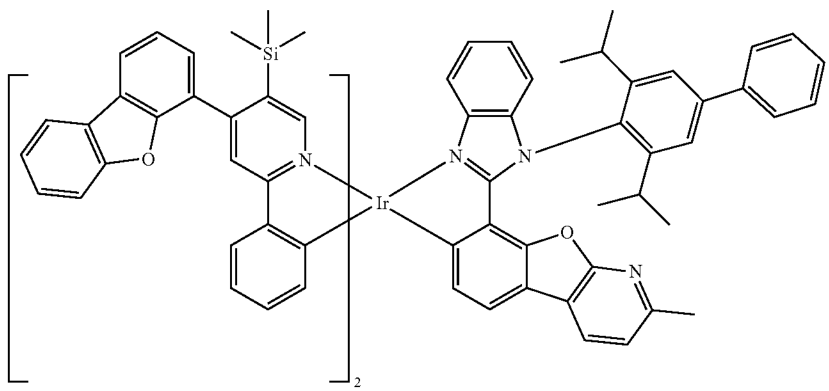
497
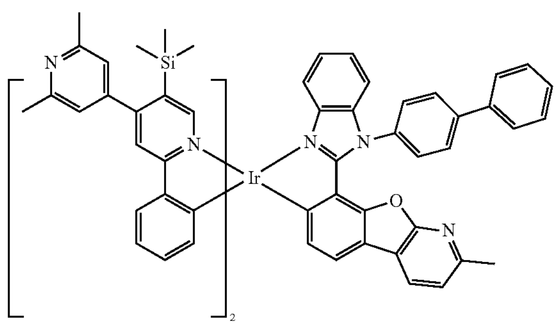
498
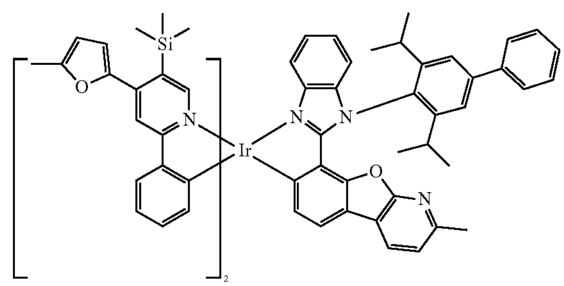
499
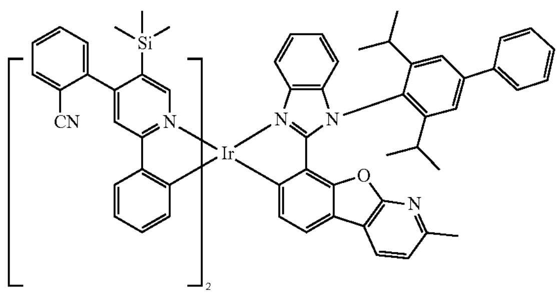
500
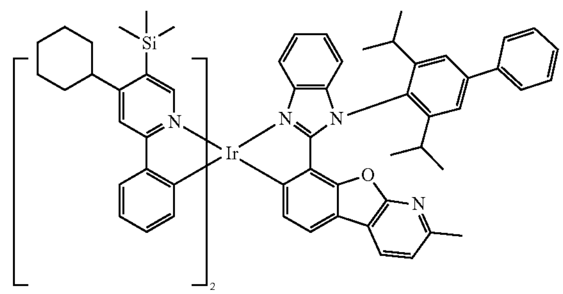
501
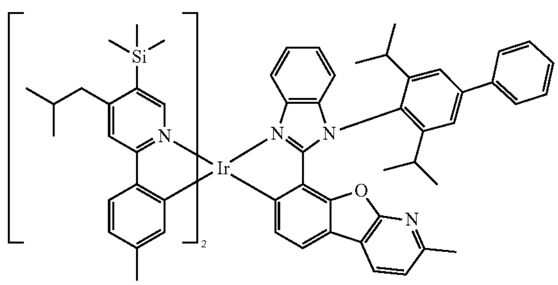
502
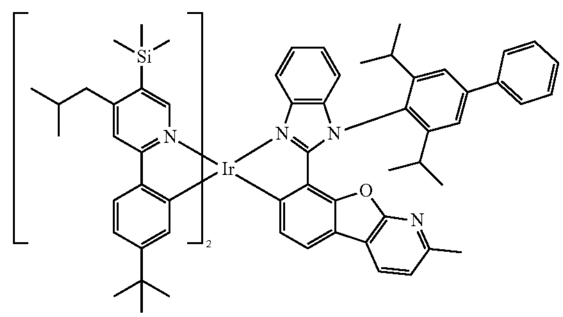

-continued
503
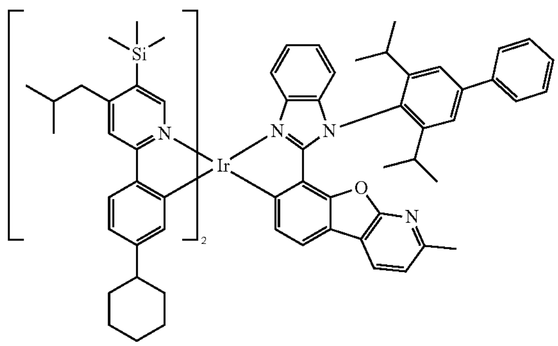
504
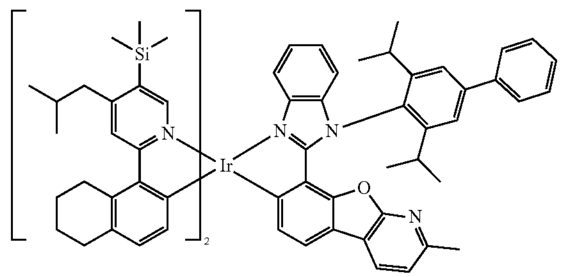
505
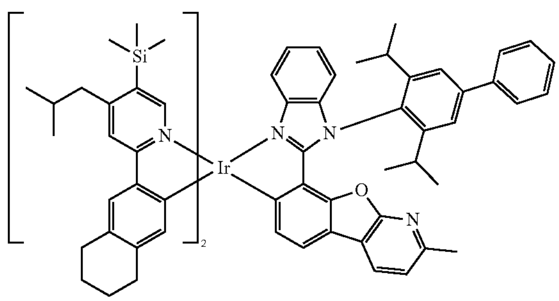
506
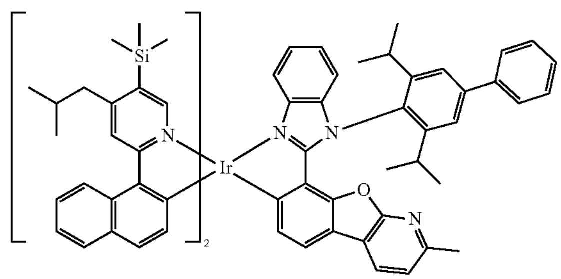
507
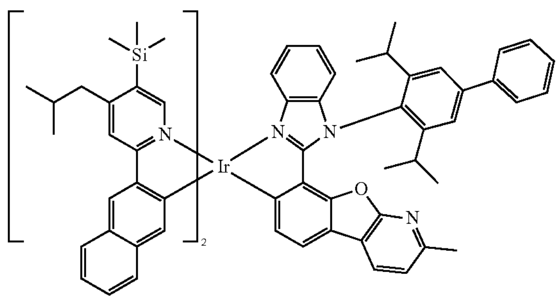
508
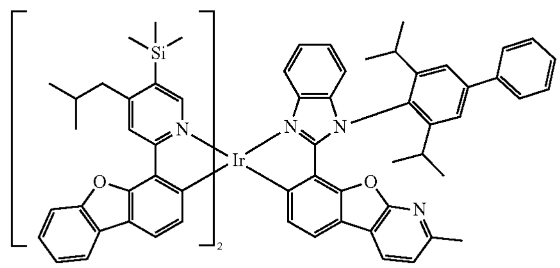
509
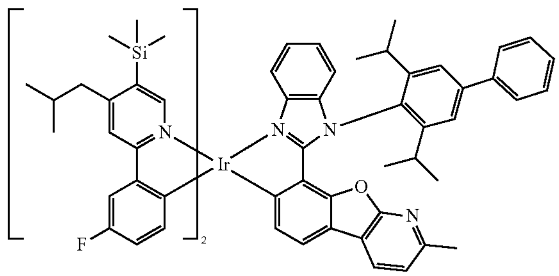
510
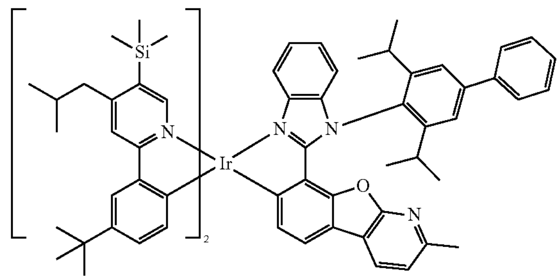
511
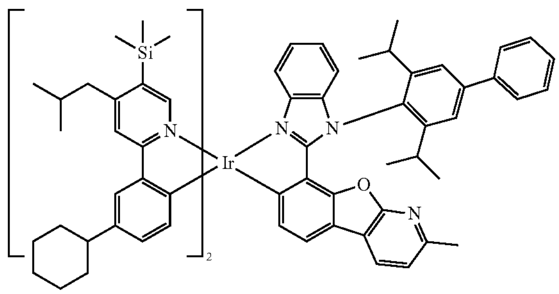
512
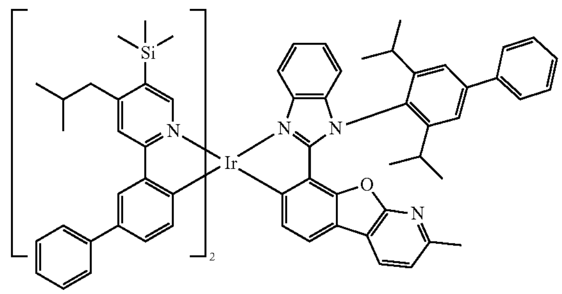

-continued
513
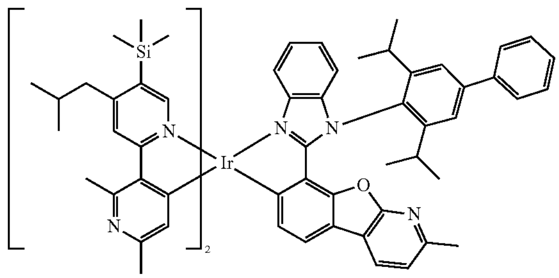
514
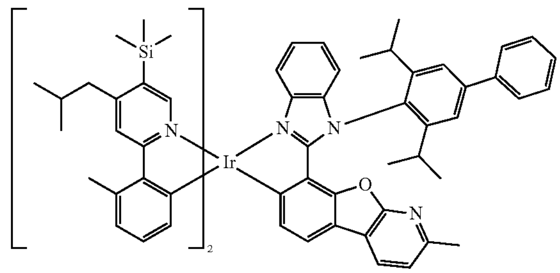
515
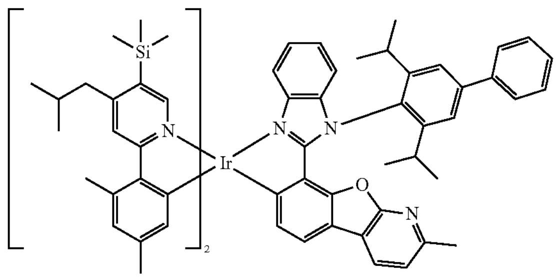
516
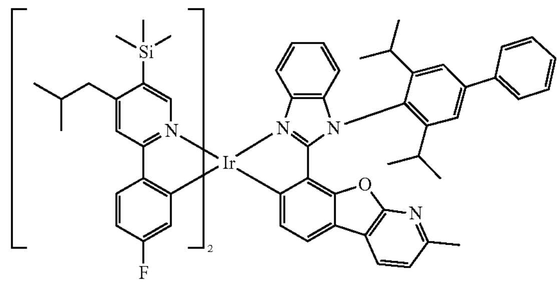
517
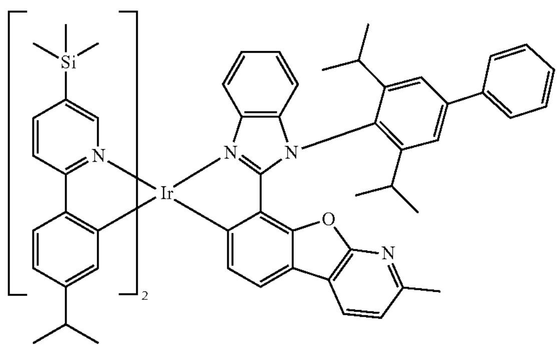
518
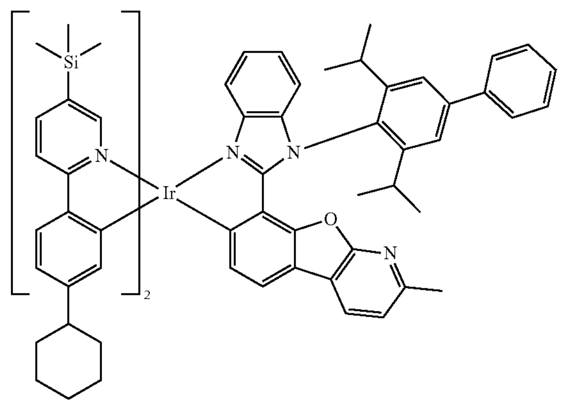
519
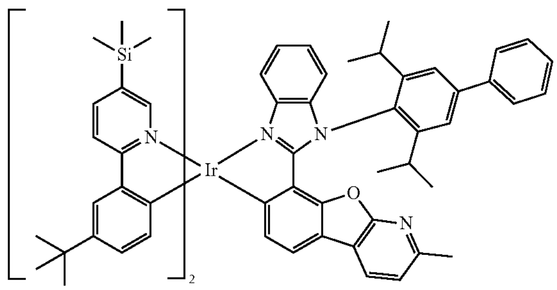
520
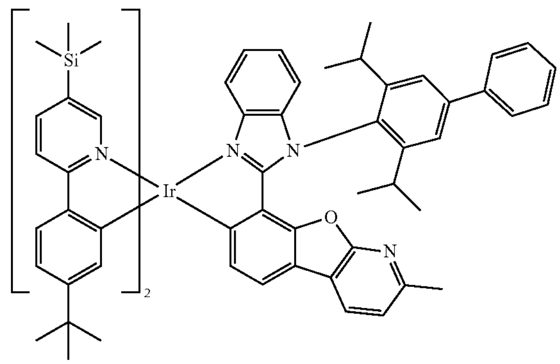

-continued
521
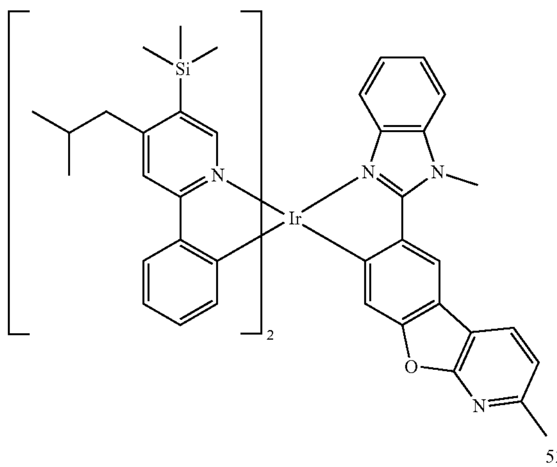
522
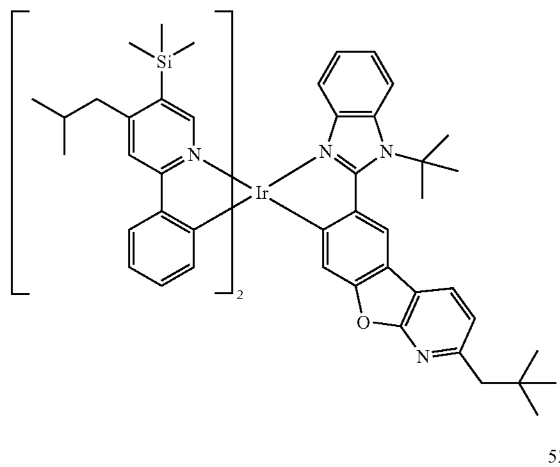
523
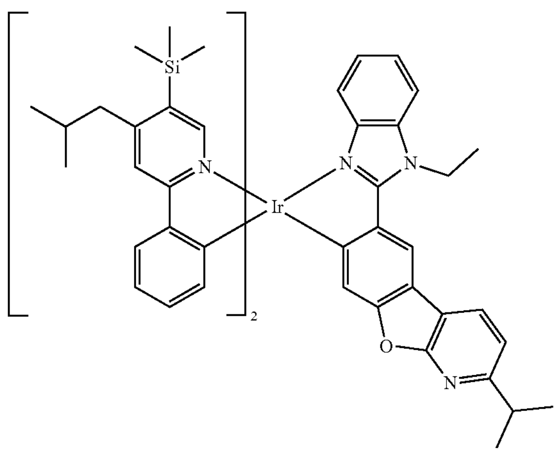
524
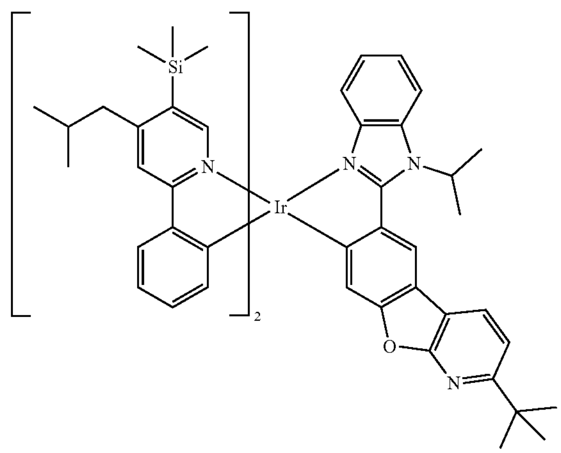
525
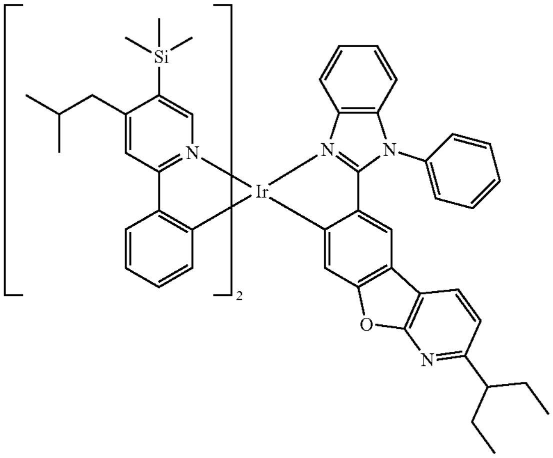
526
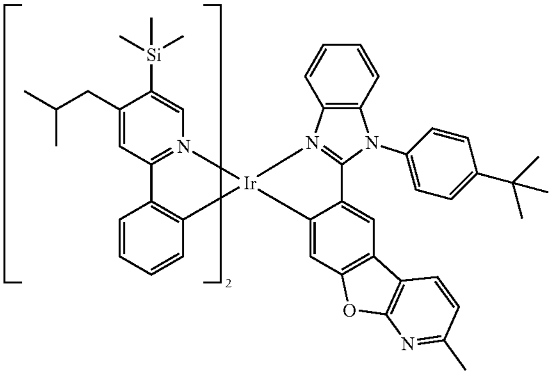

-continued
527
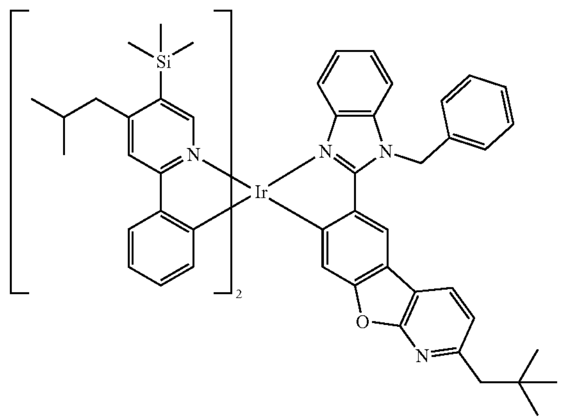
528
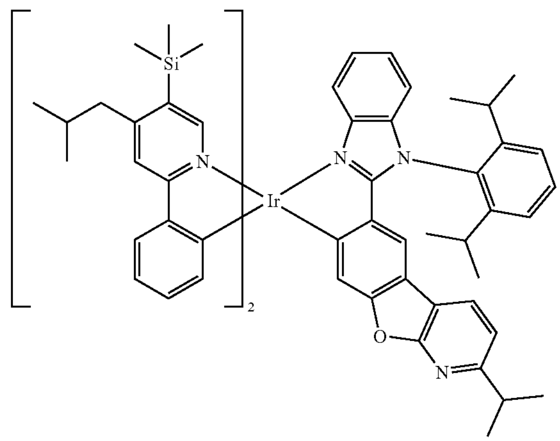
529
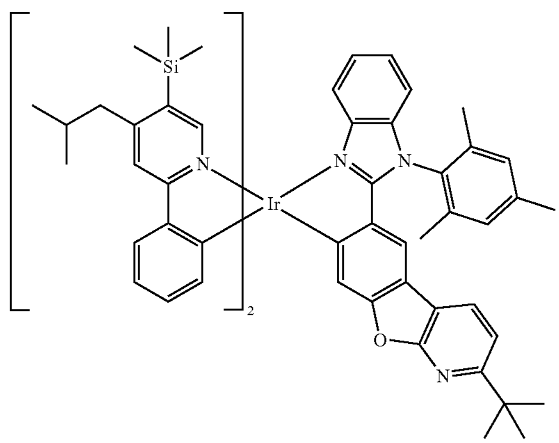
530
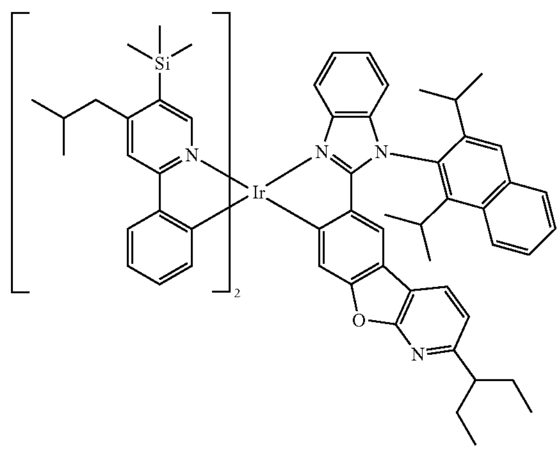
531
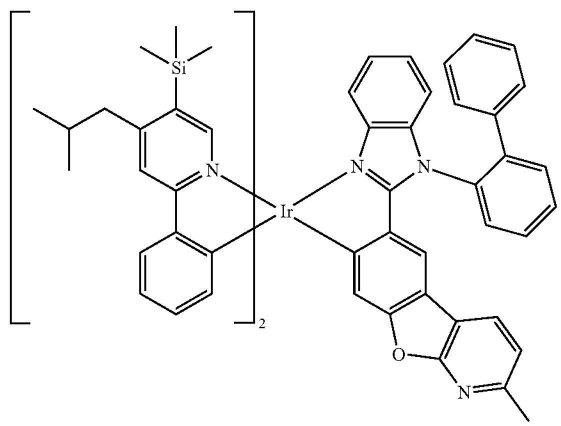
532
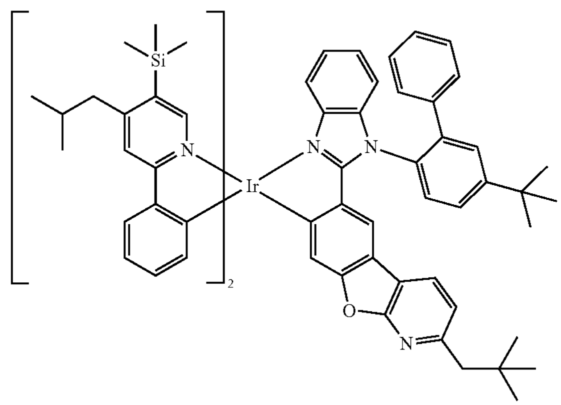

-continued
533
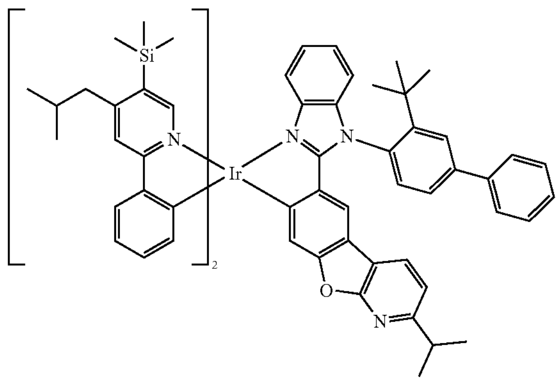
534
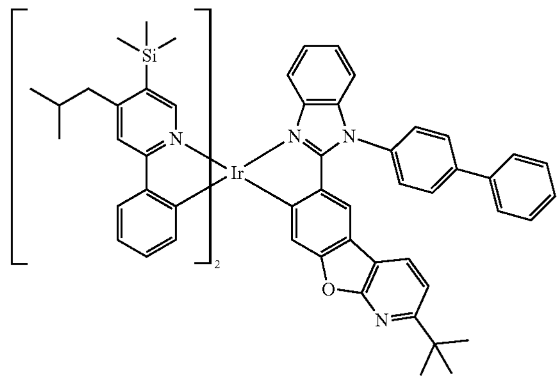
535
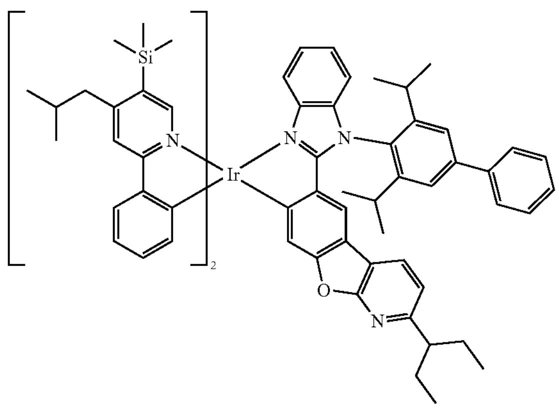
536
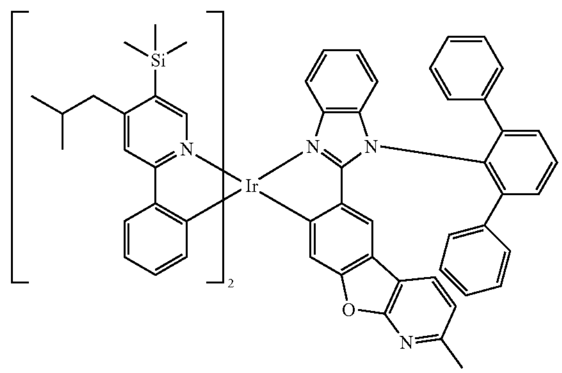
537
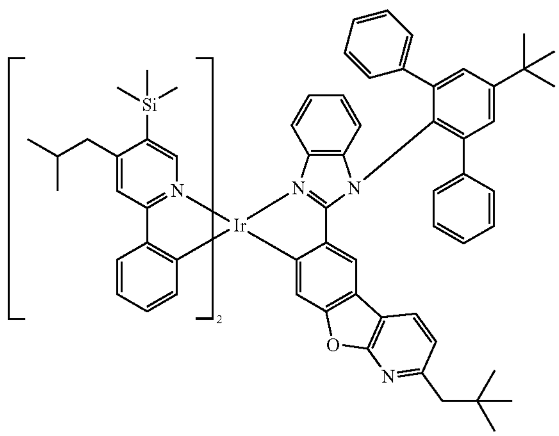
538
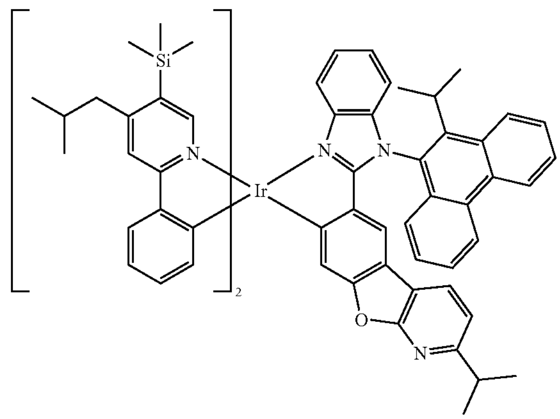

-continued
539
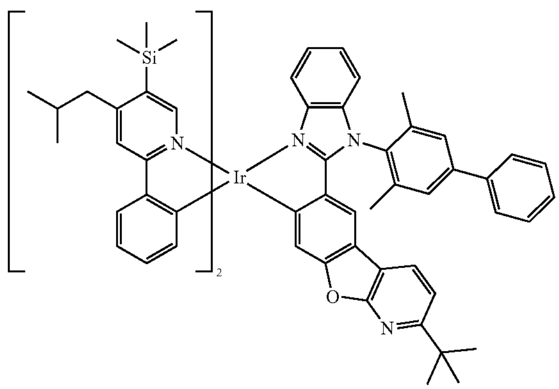
549
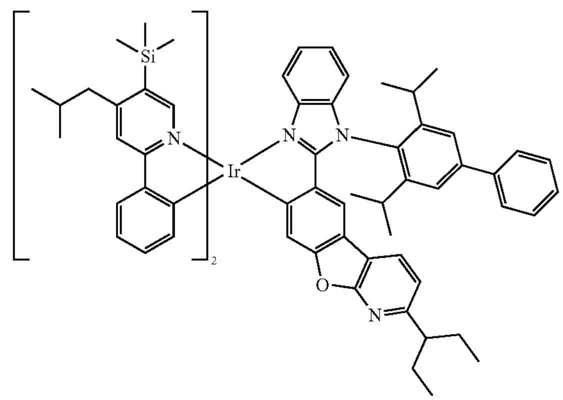
541
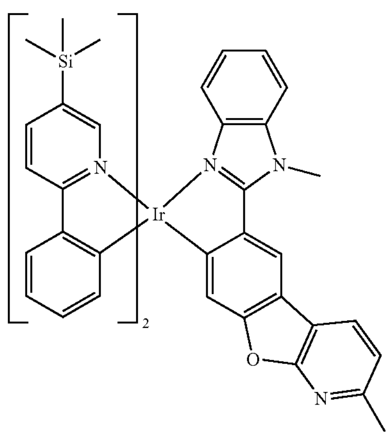
542
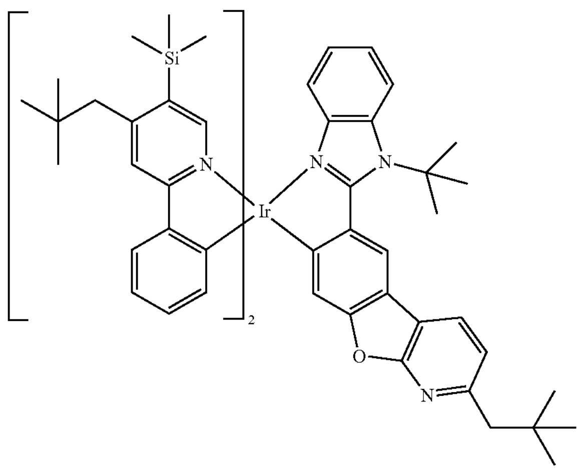

-continued
543
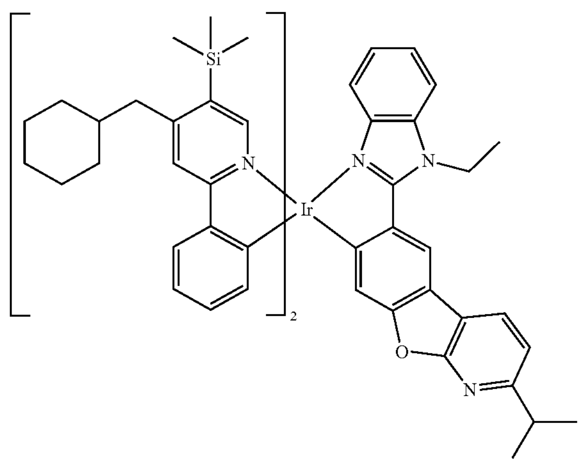
544
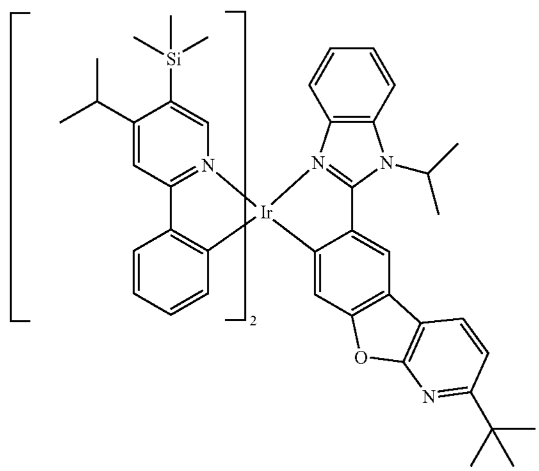
545
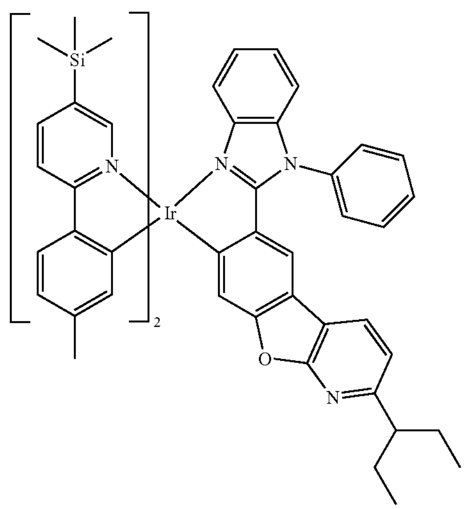

-continued
546
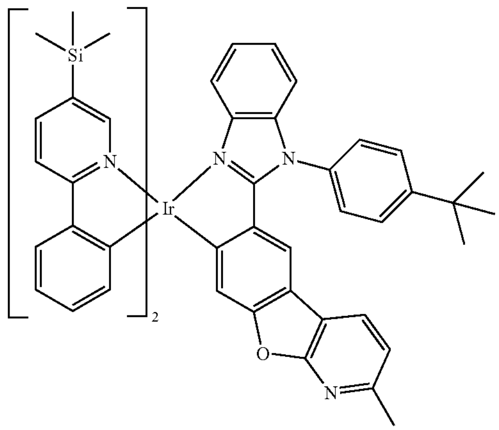
547
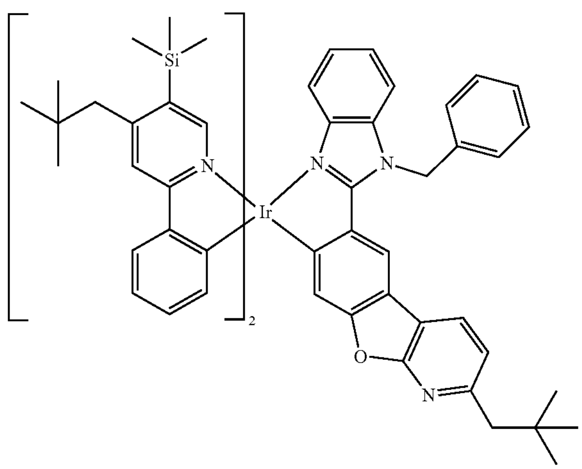
548
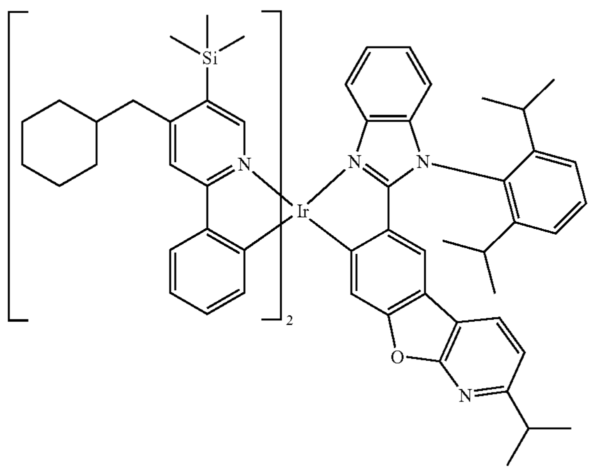

-continued
549
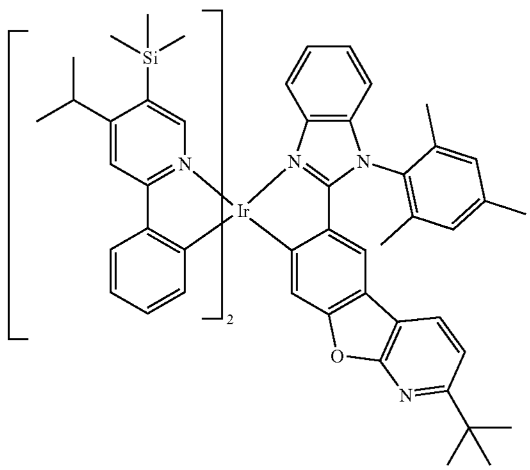
550
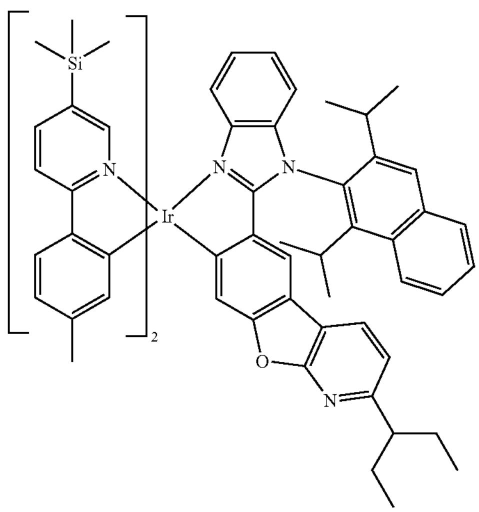
551
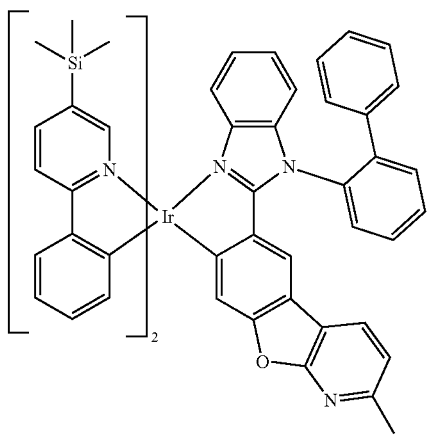

-continued
552
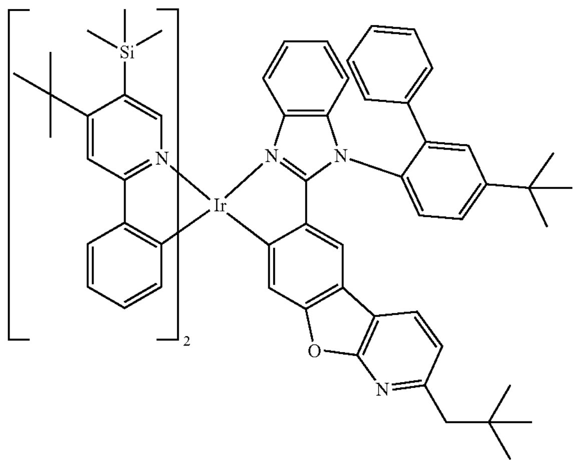
553
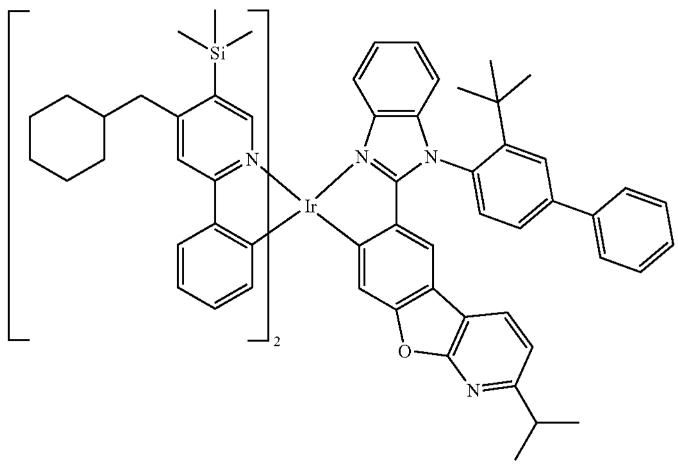
554
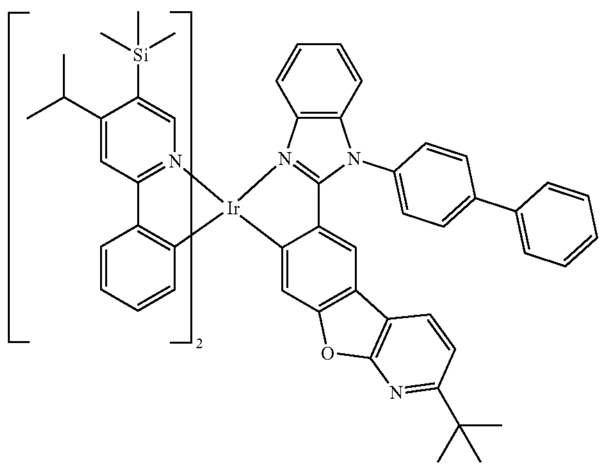

-continued
555
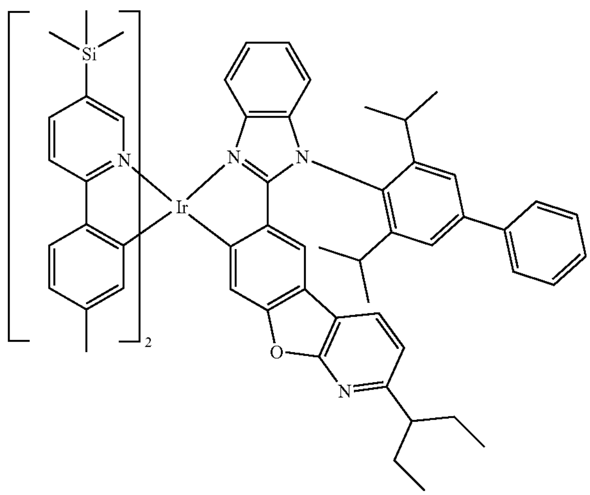
556
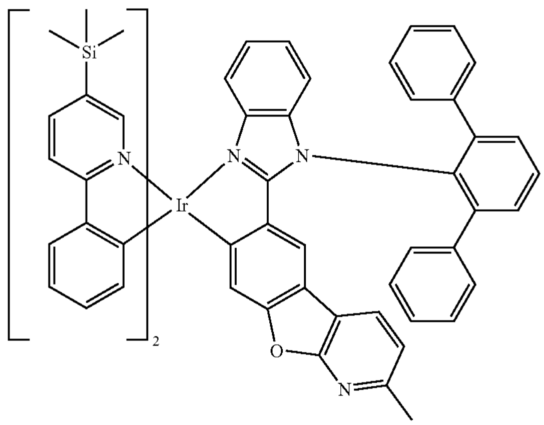
557
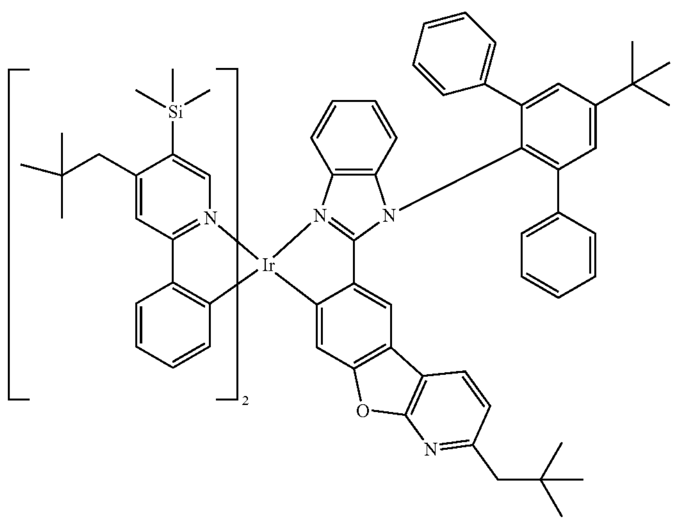

-continued
558
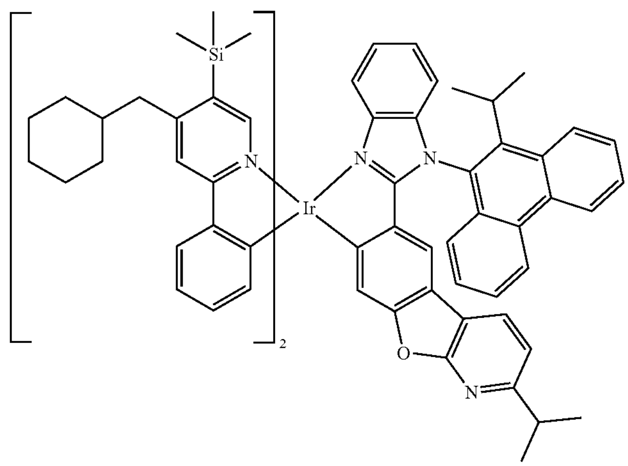
559
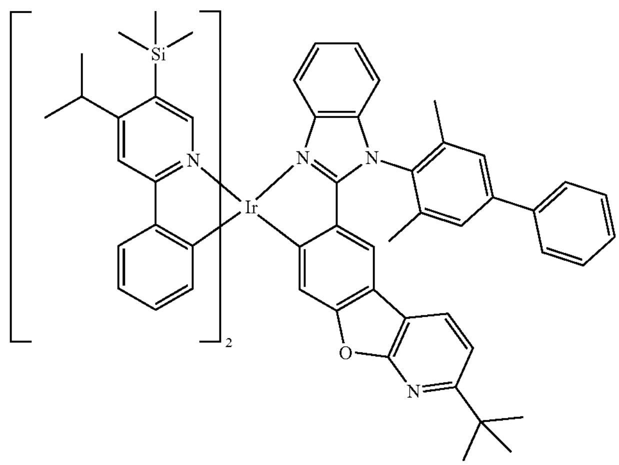
560
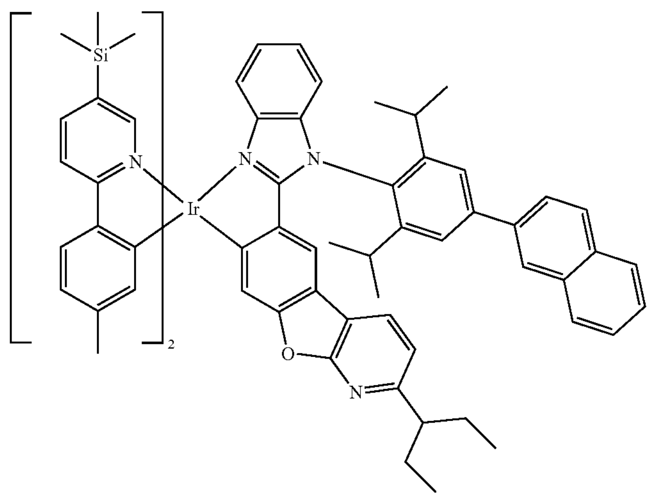

-continued
561
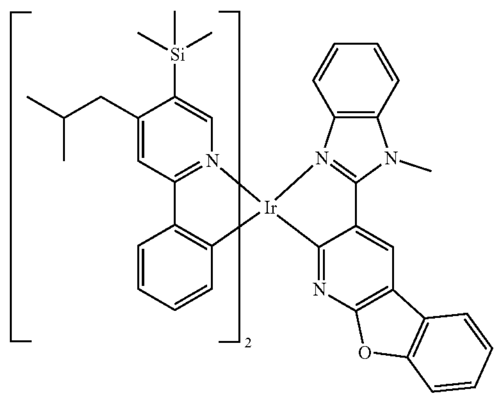
562
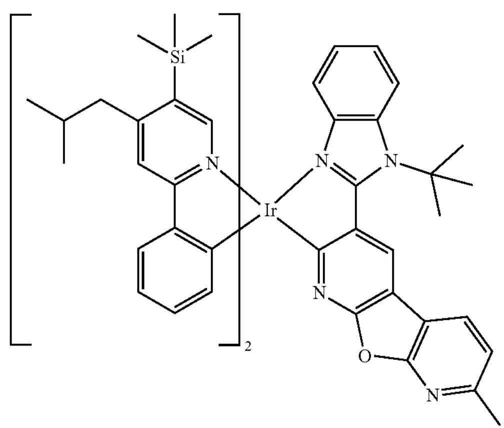
563
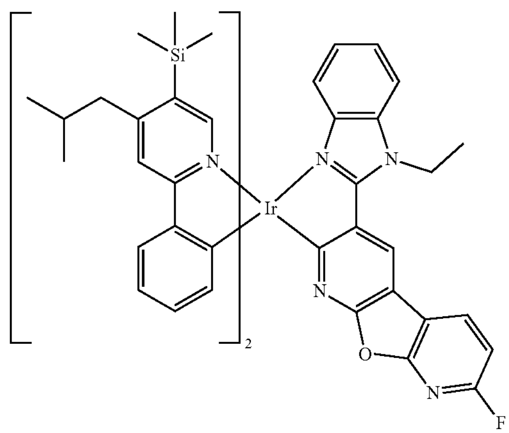

-continued
564
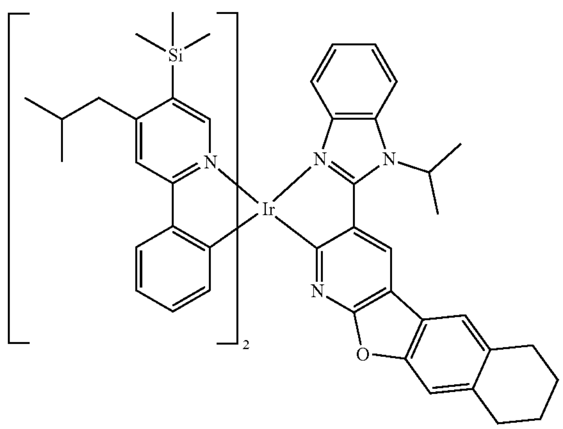
565
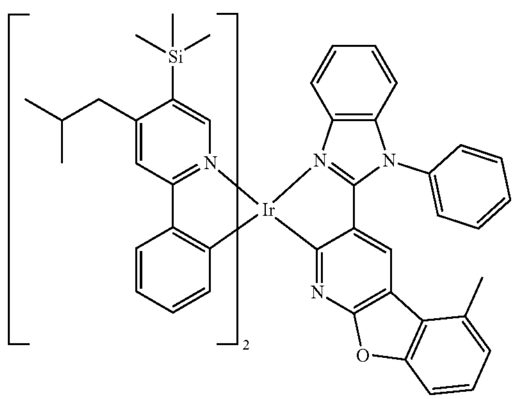
566
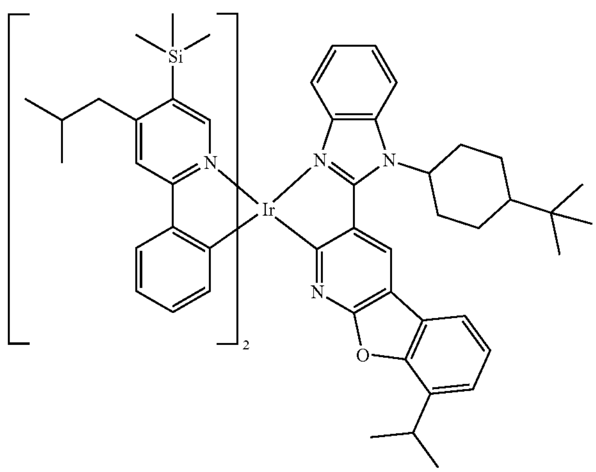

-continued
567
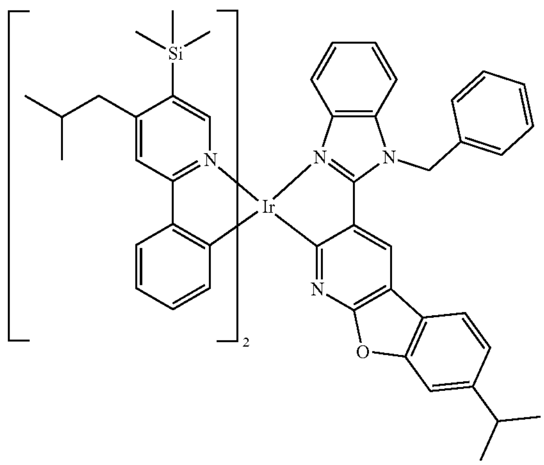
568
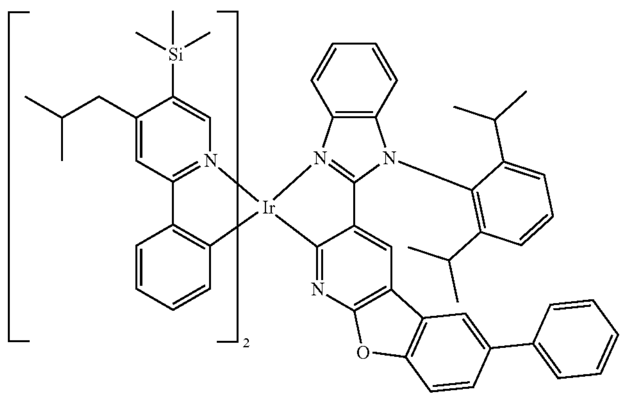
569
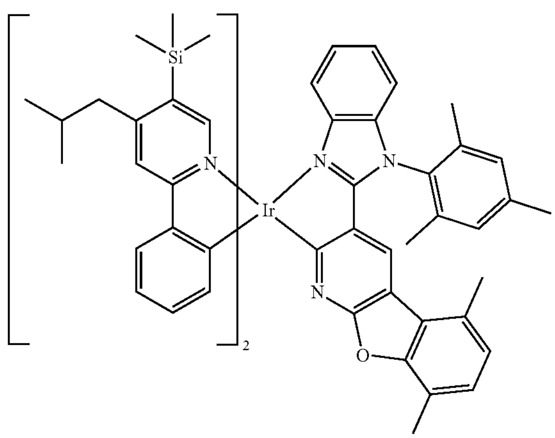

-continued
570
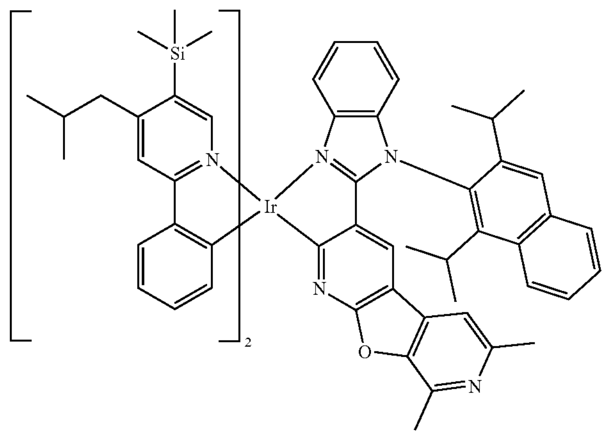
571
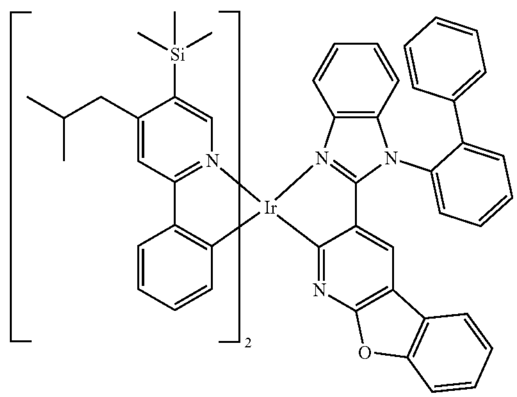
572
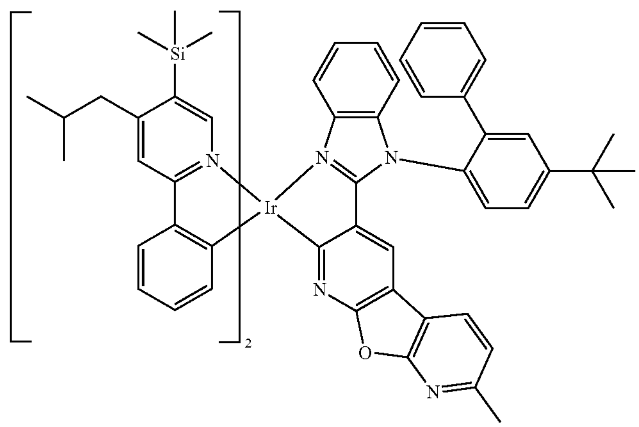

-continued
573
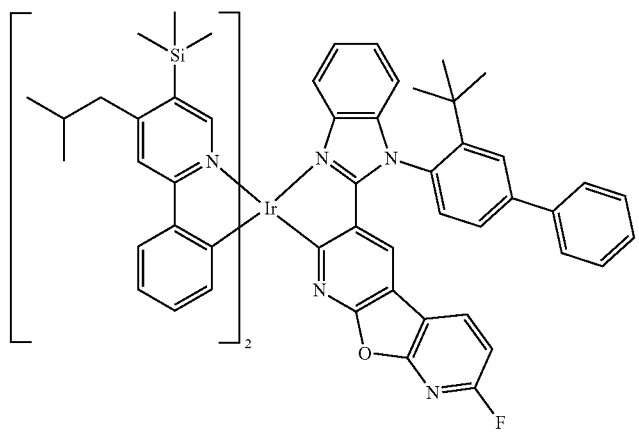
574
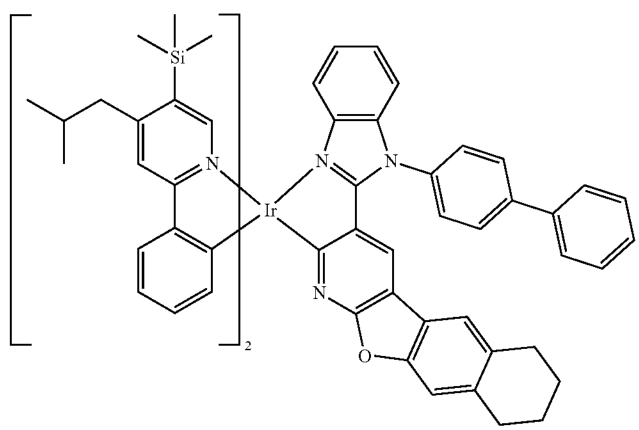
575
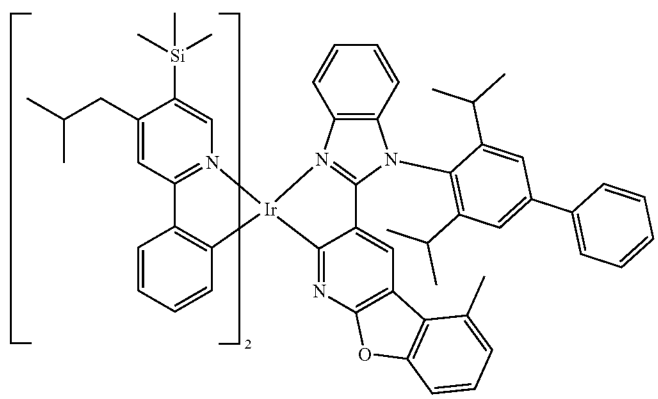

-continued
576
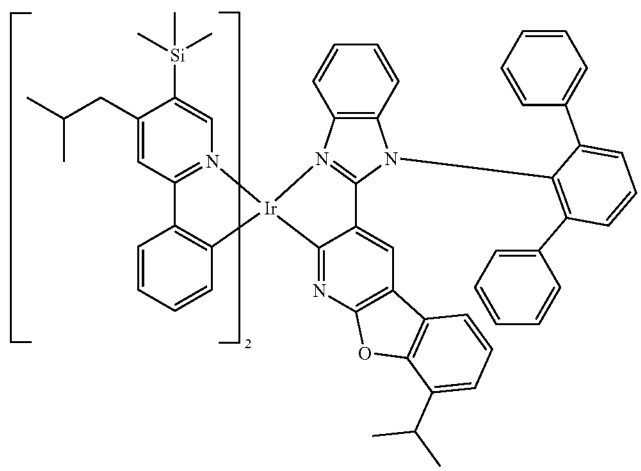
577
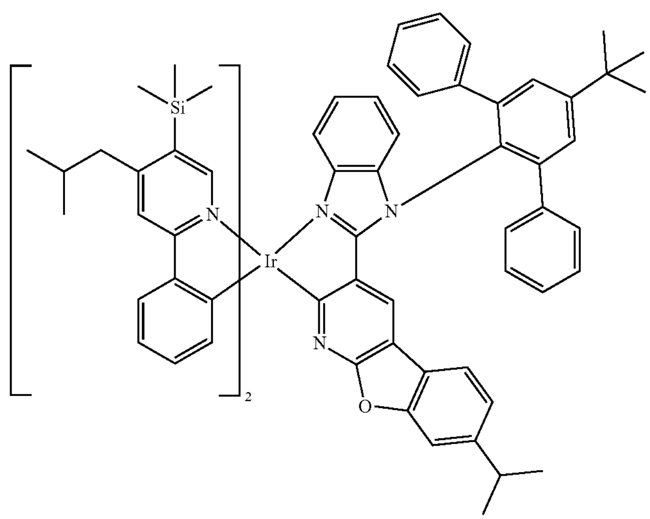
578
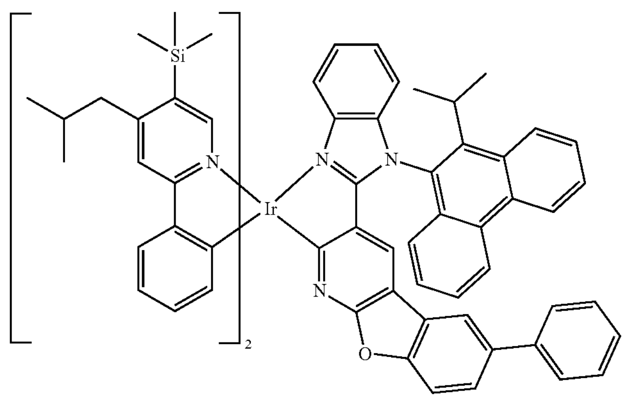

-continued
579
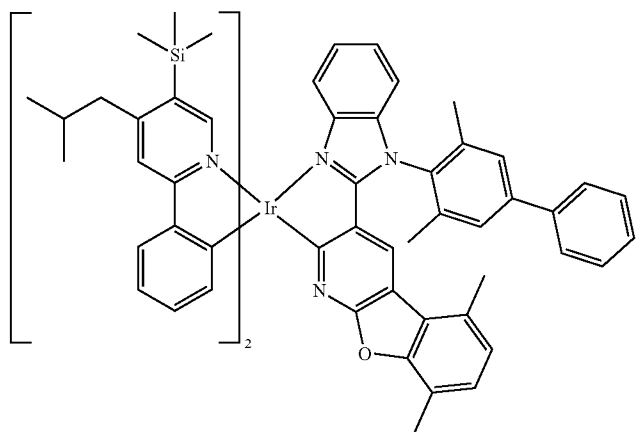
580
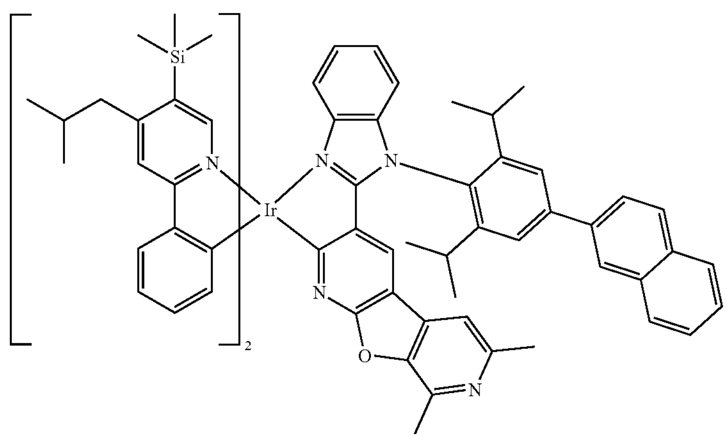
581
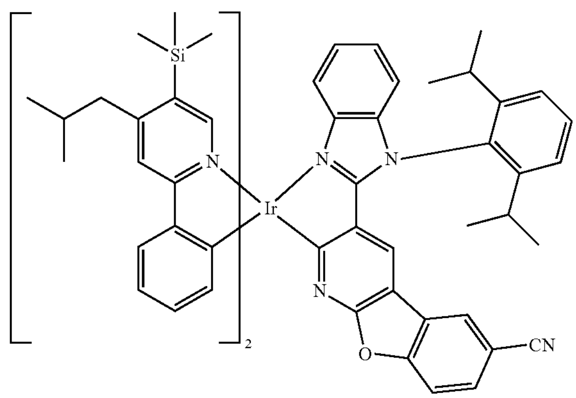

-continued
582
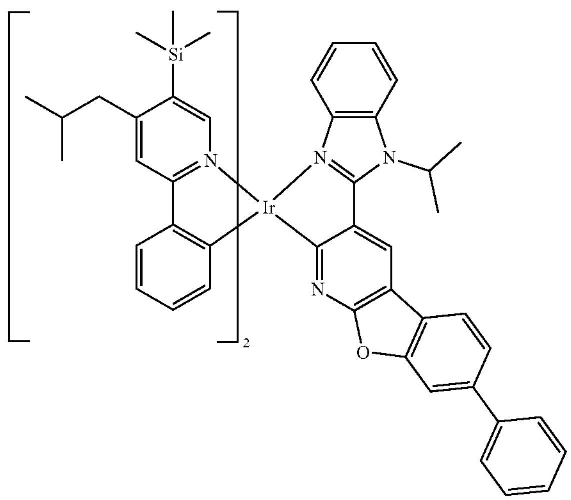
583
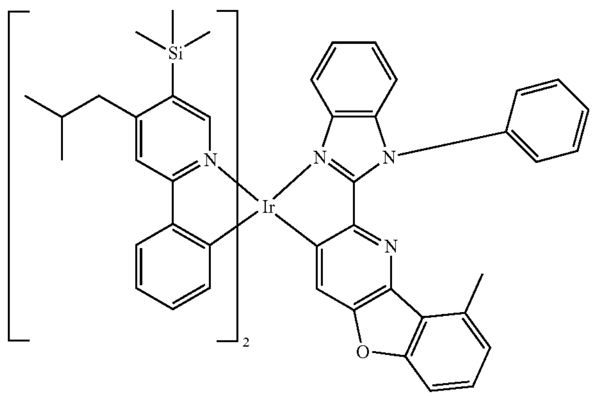
584
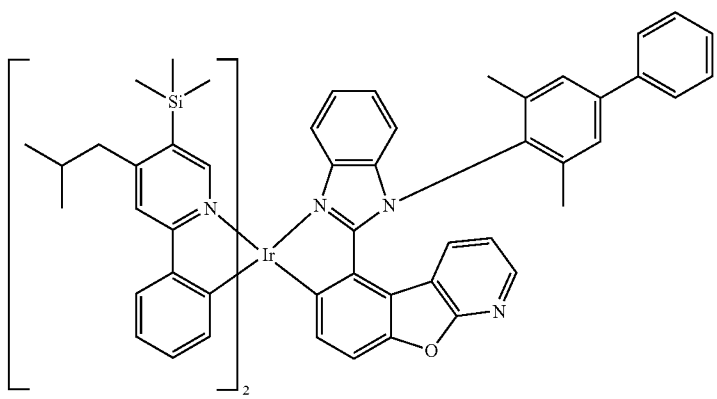

-continued
585
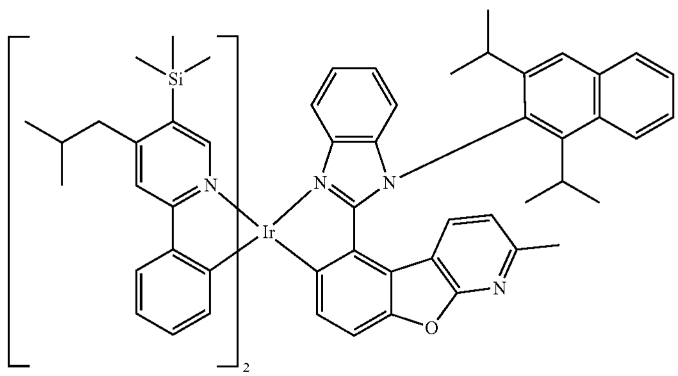
586
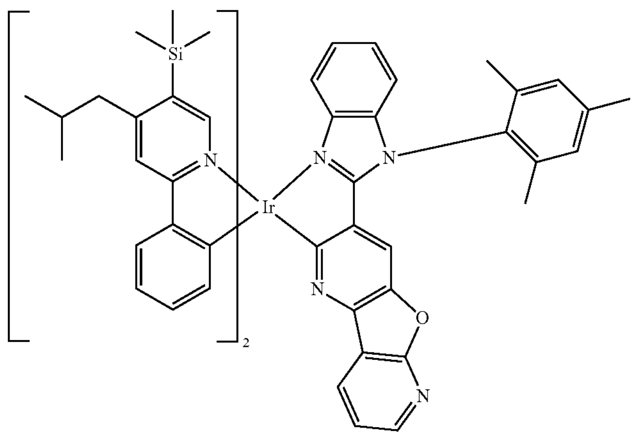
587
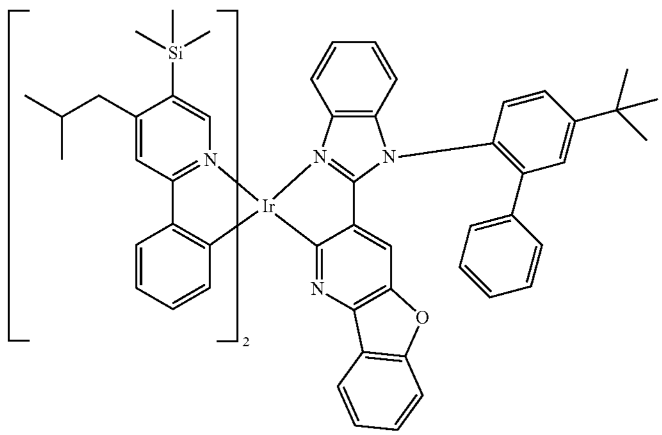

-continued
588
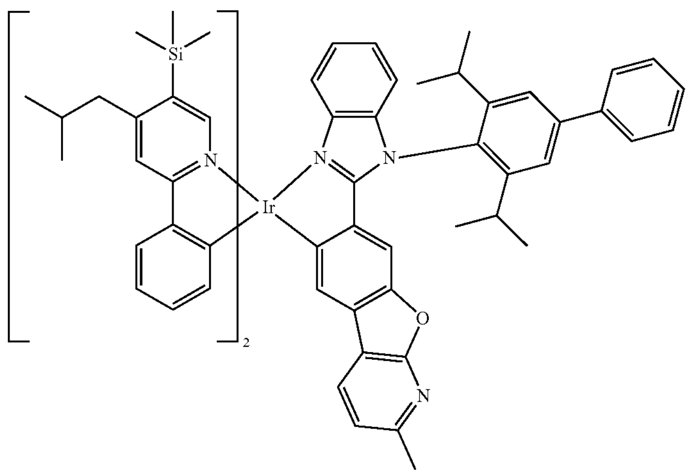
589
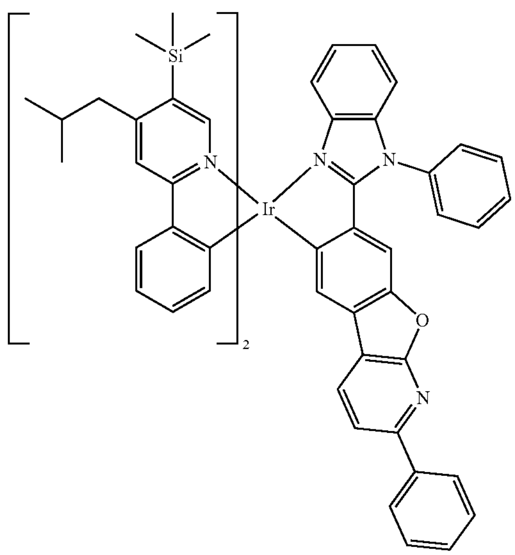
590
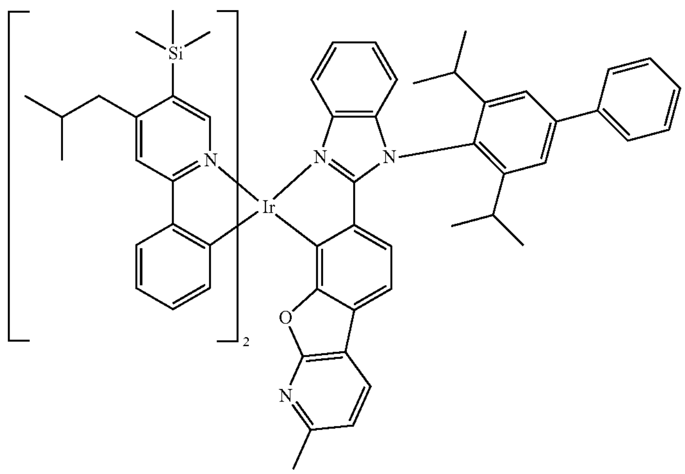

-continued
591
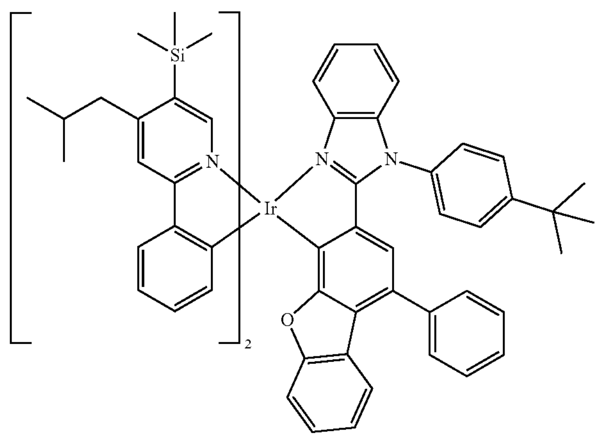
592
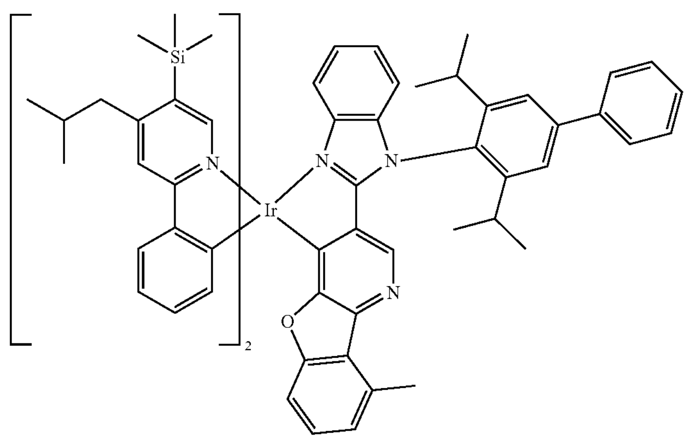
593
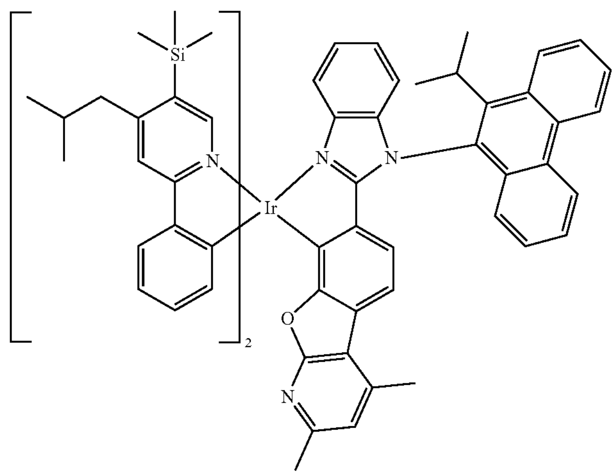

-continued
594
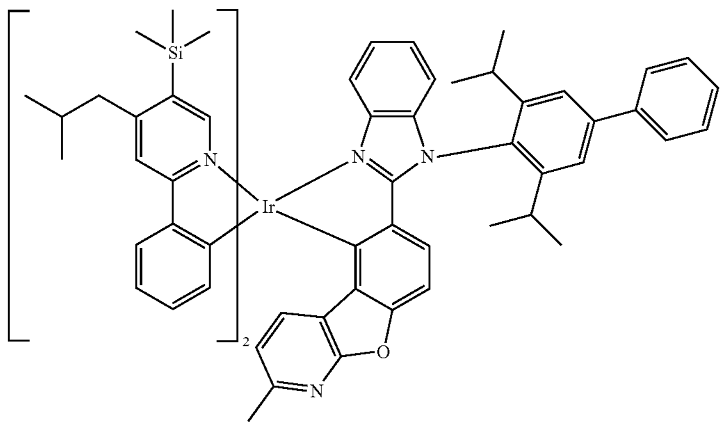
595
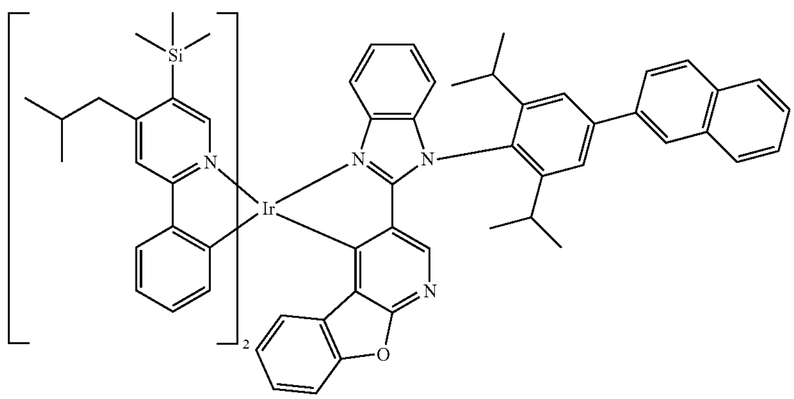
596
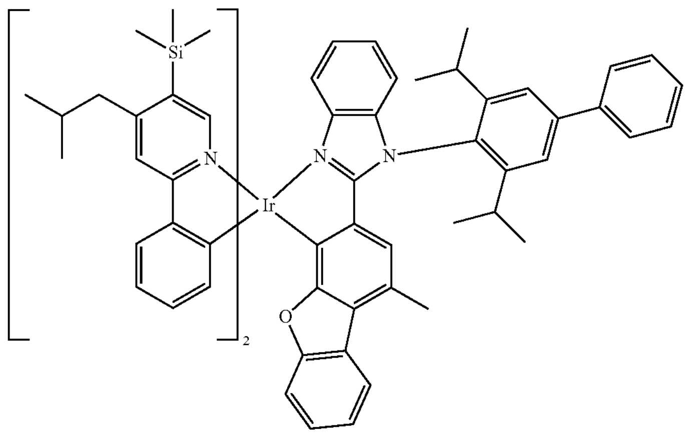

-continued
597
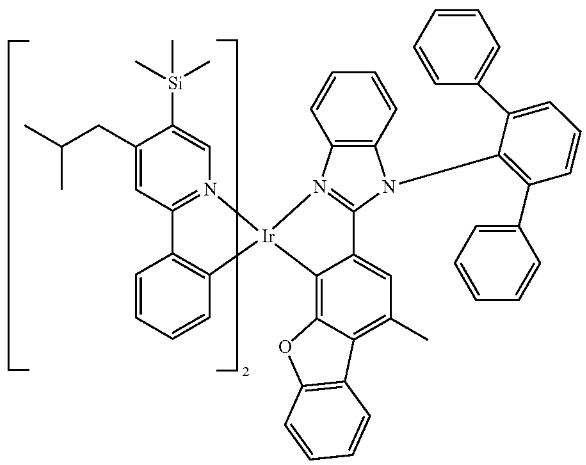
598
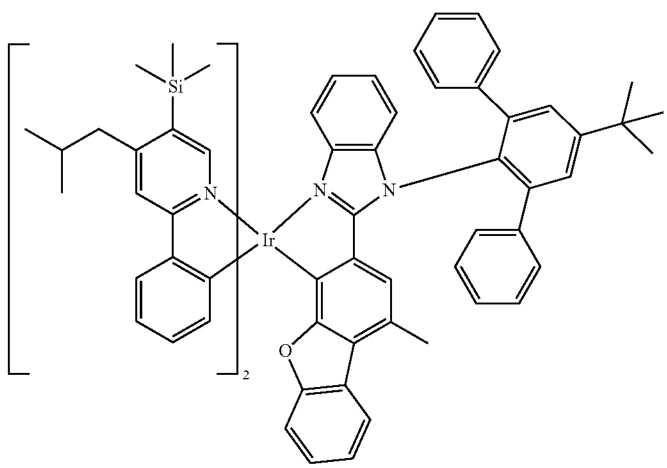
599
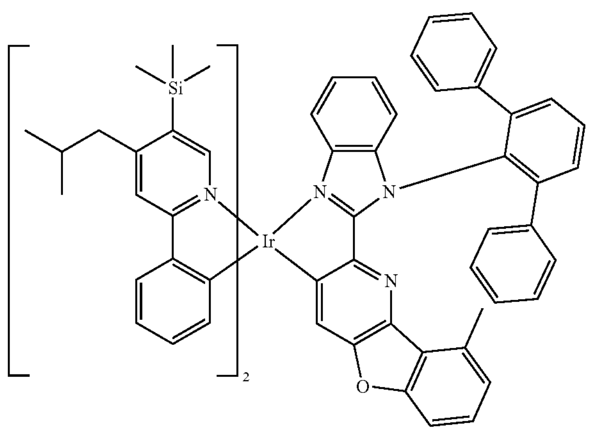

-continued
600
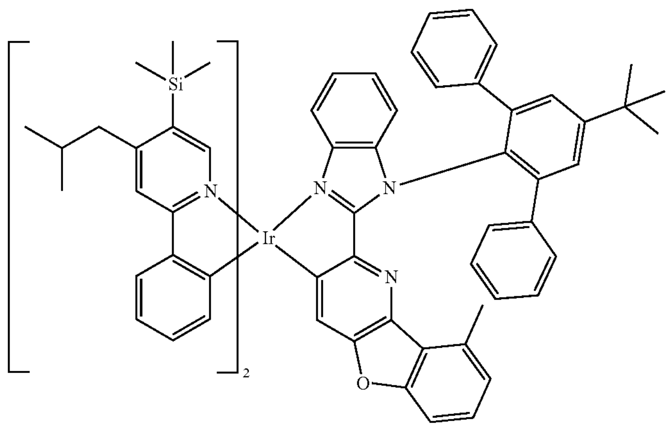
601
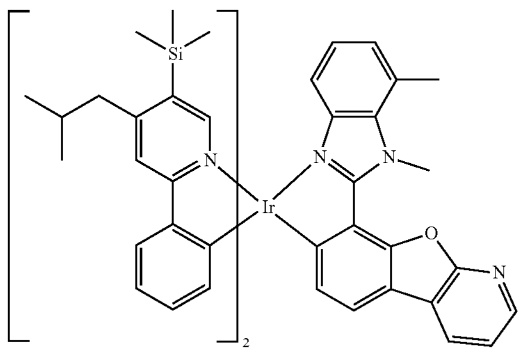
602
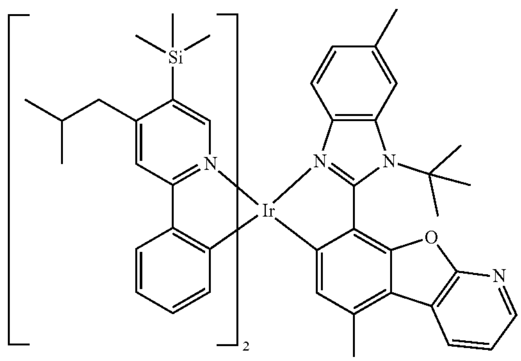
603
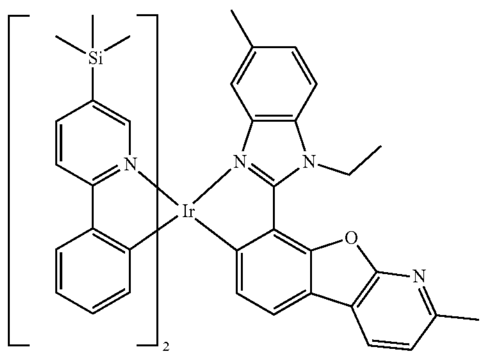

-continued
604
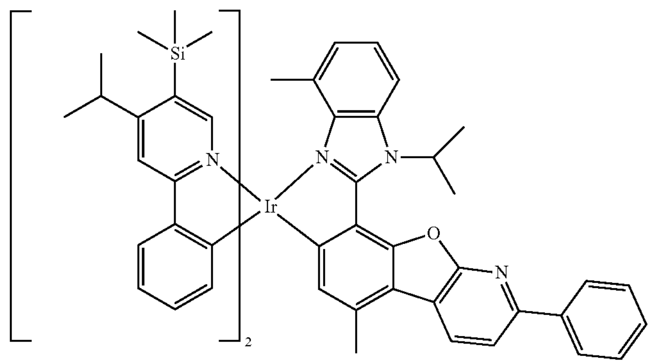
605
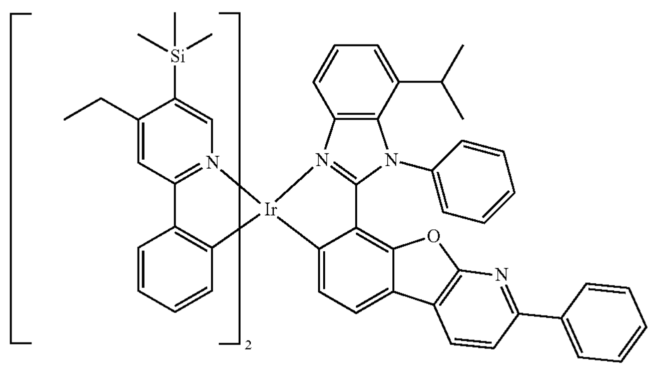
606
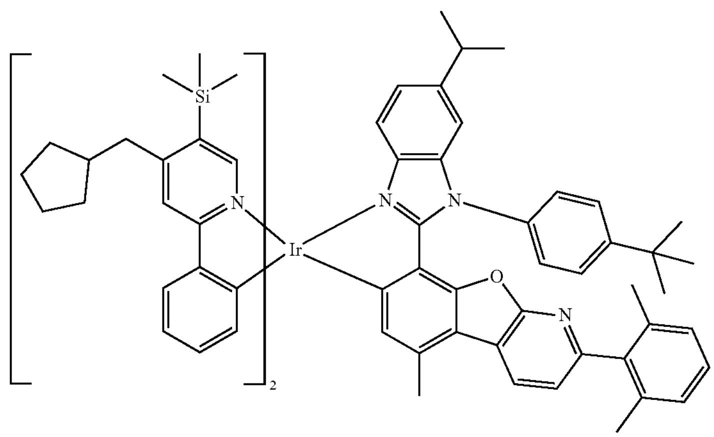
607
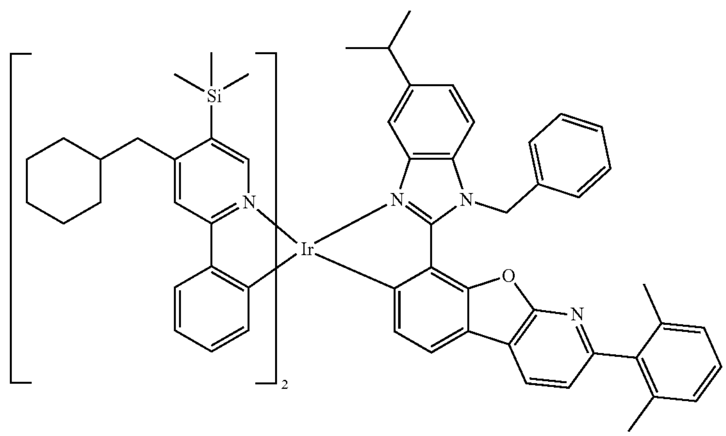

-continued
608
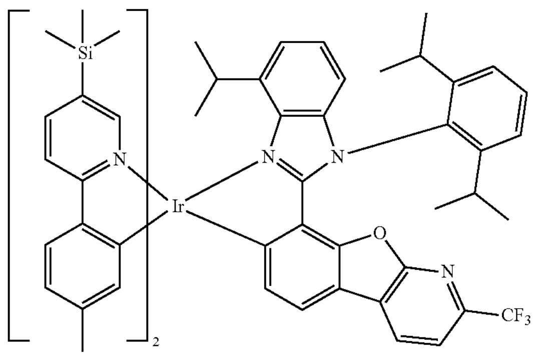
609
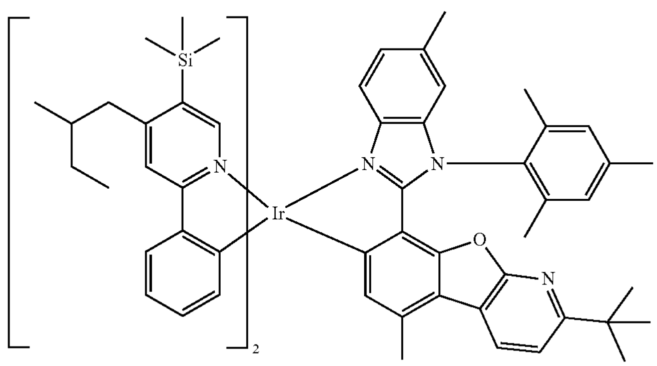
610
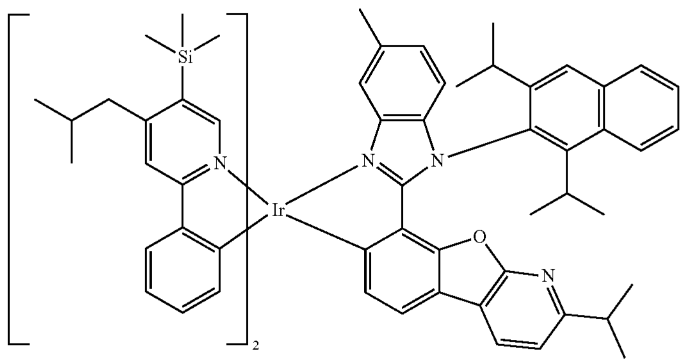
611
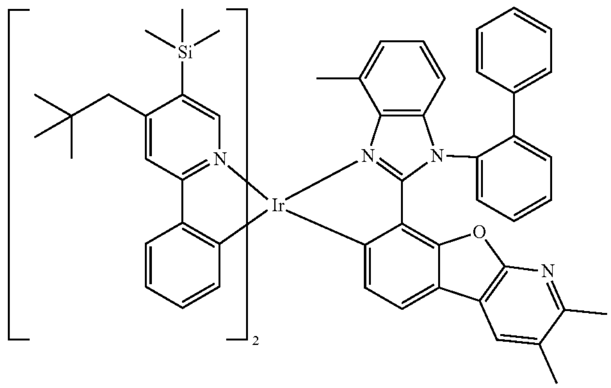

-continued
612
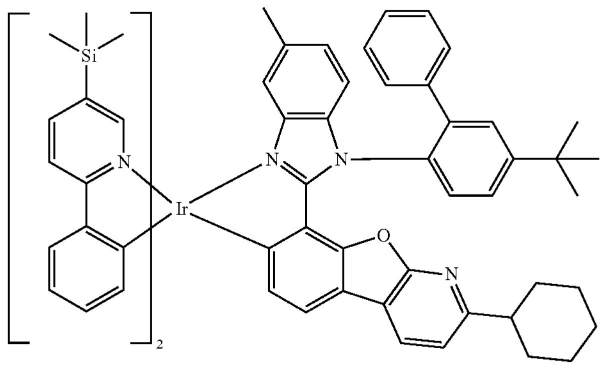
613
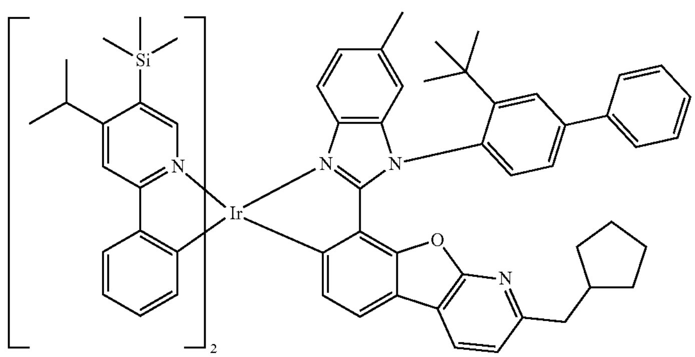
614
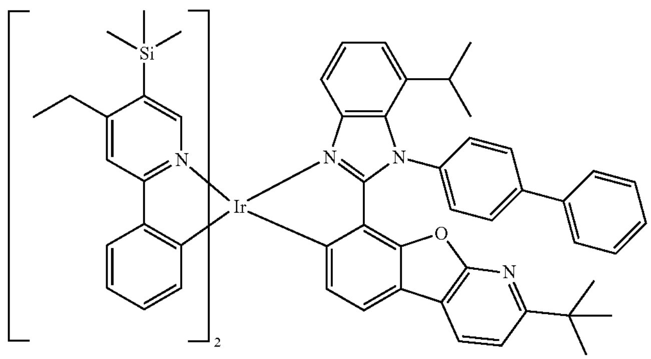
615
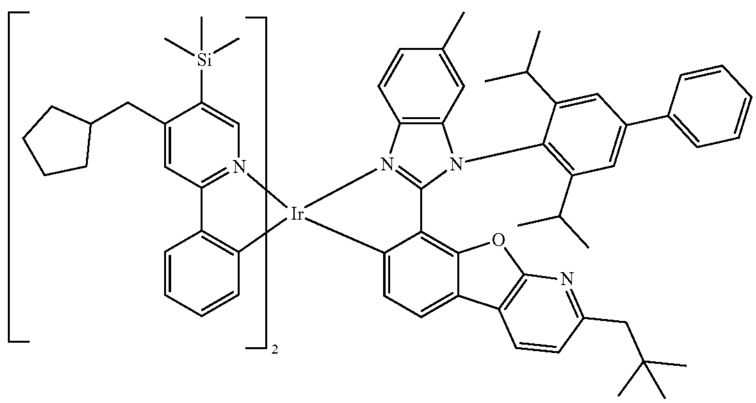

-continued
616
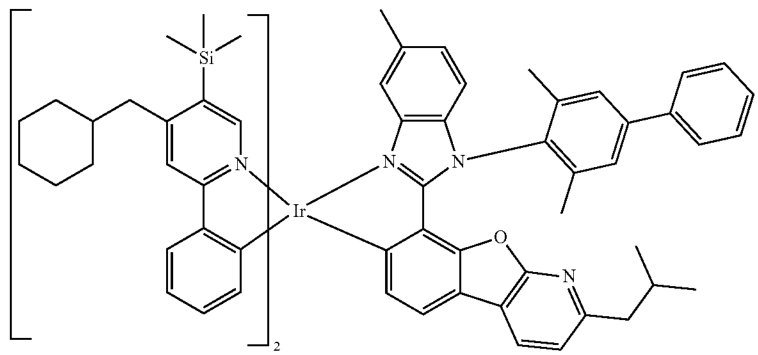
617
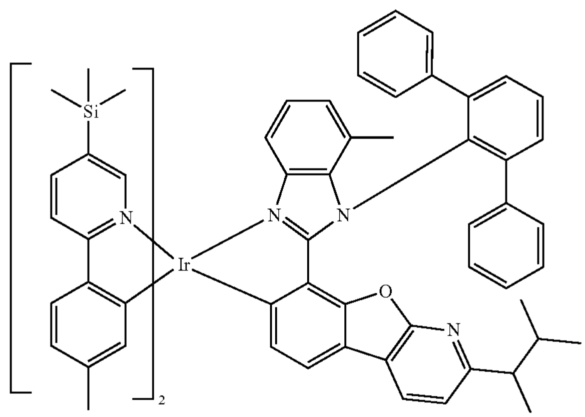
618
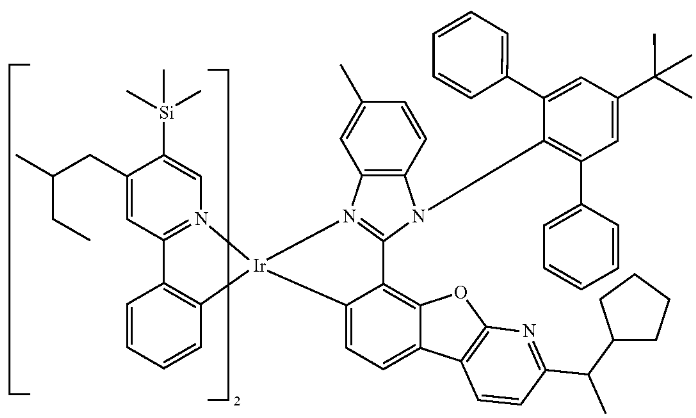
619
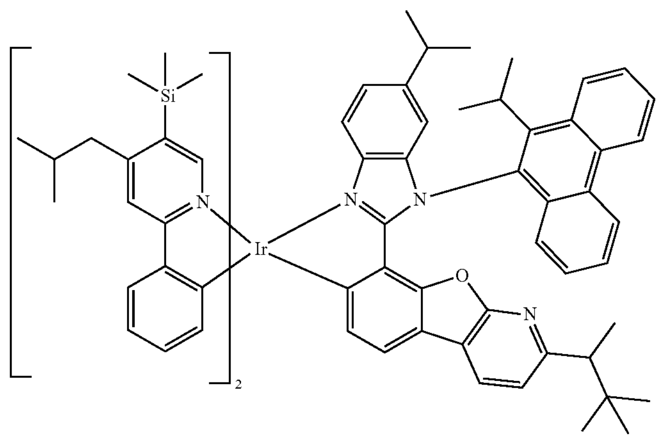

-continued
620
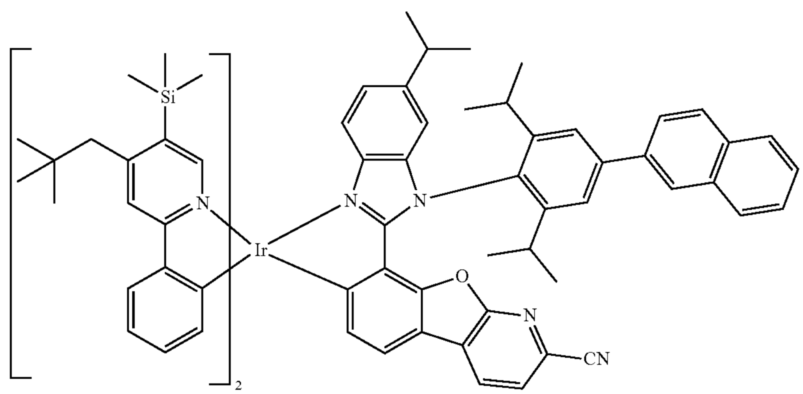
621
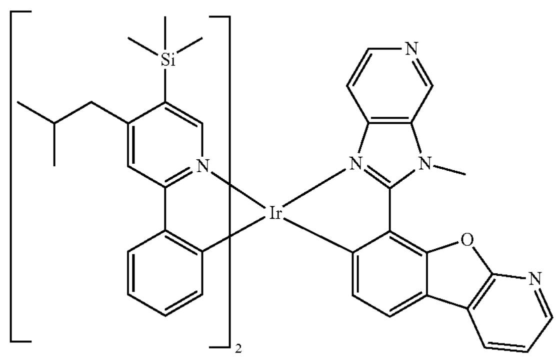
622
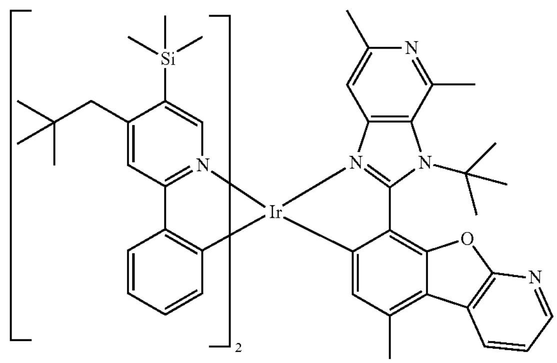
623
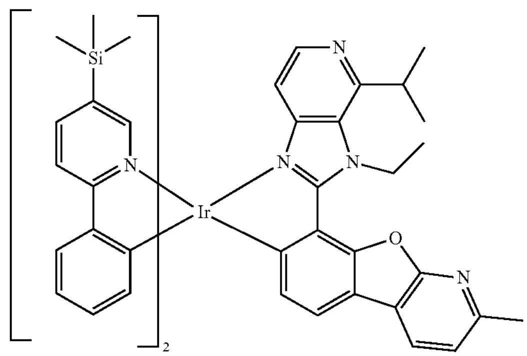

-continued
624
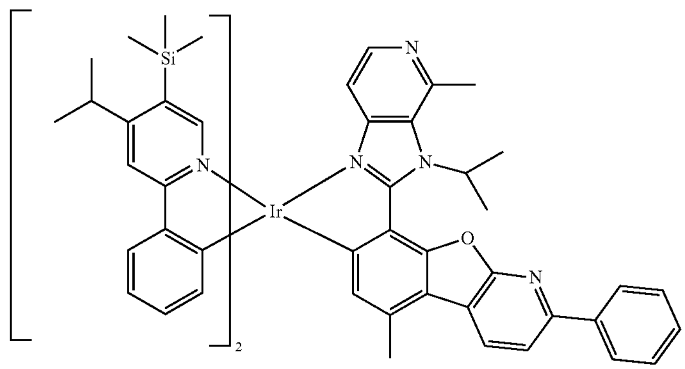
625
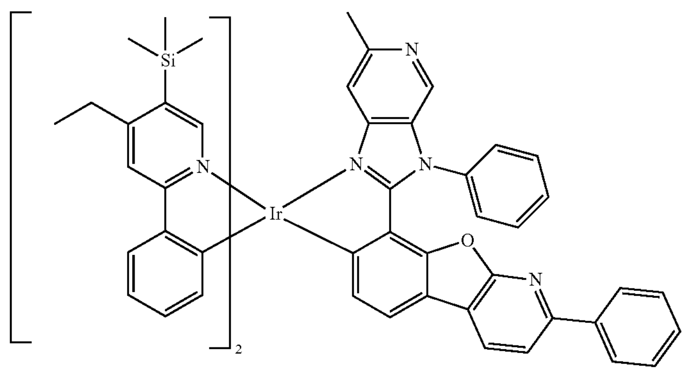
626
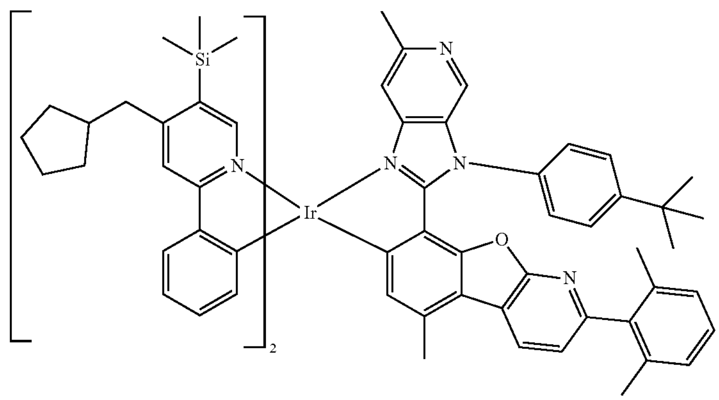
627
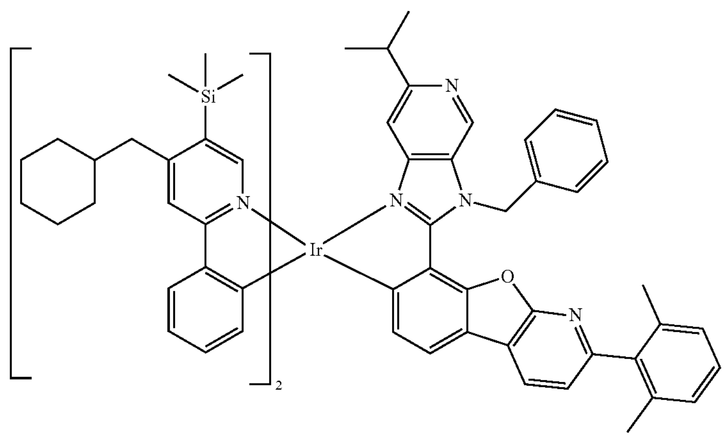

-continued
628
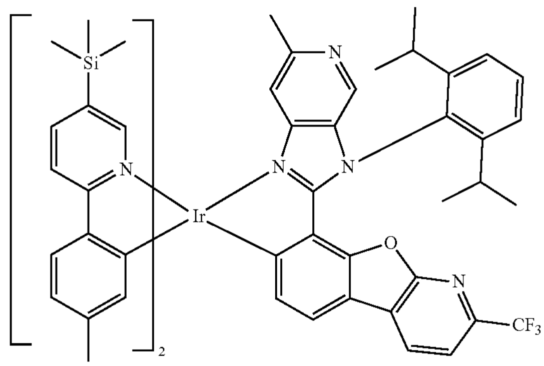
629
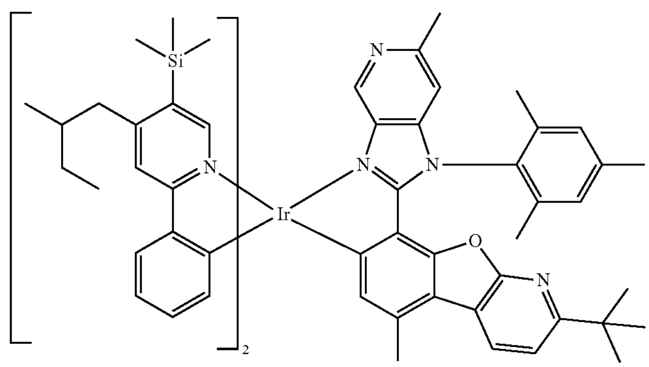
630
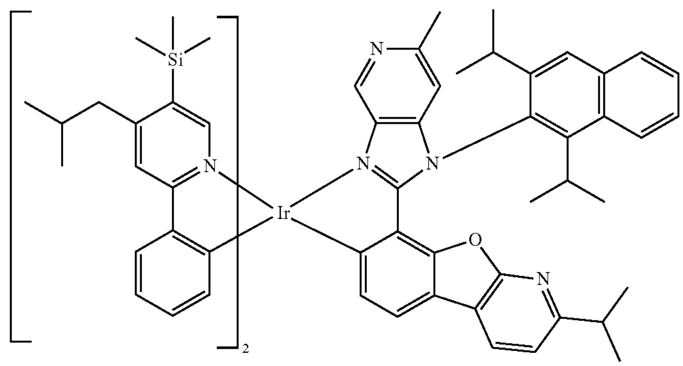
631
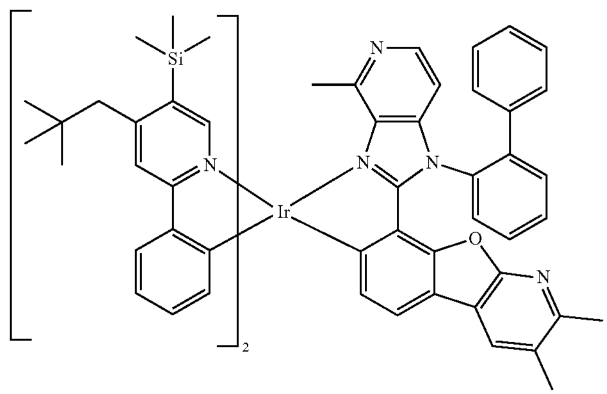

-continued
632
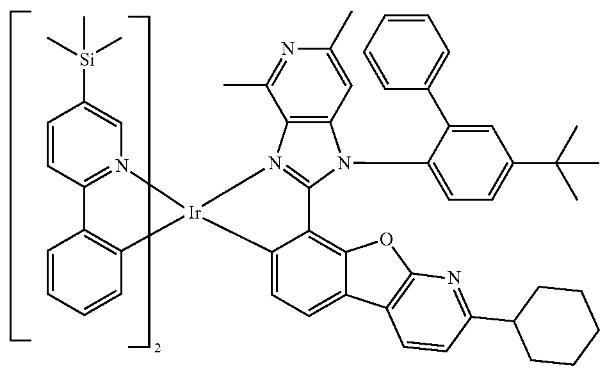
633
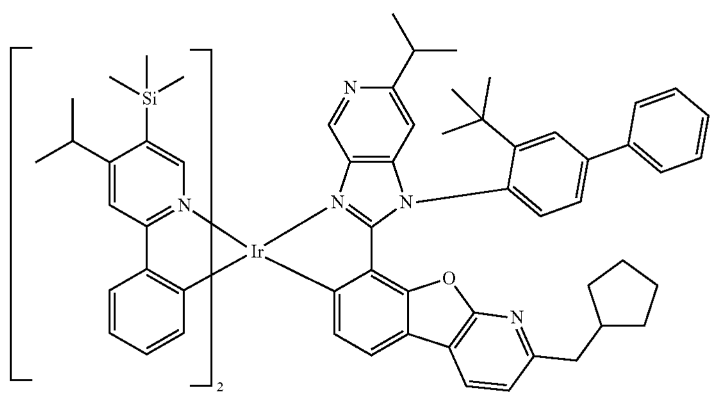
634
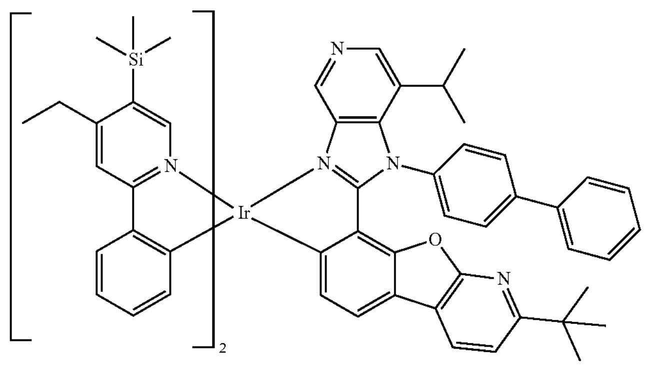
635
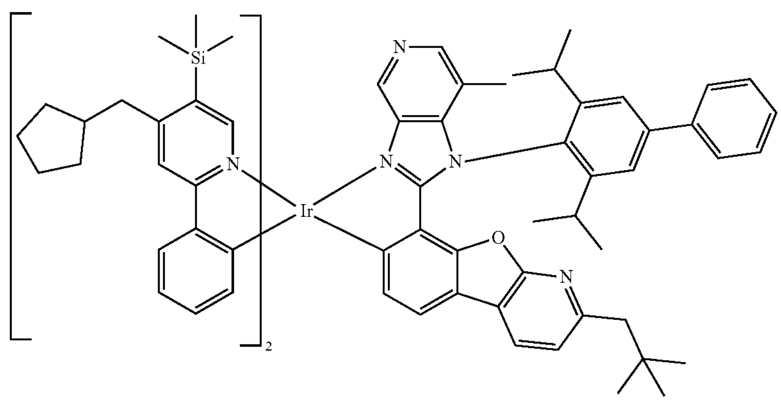

-continued
636
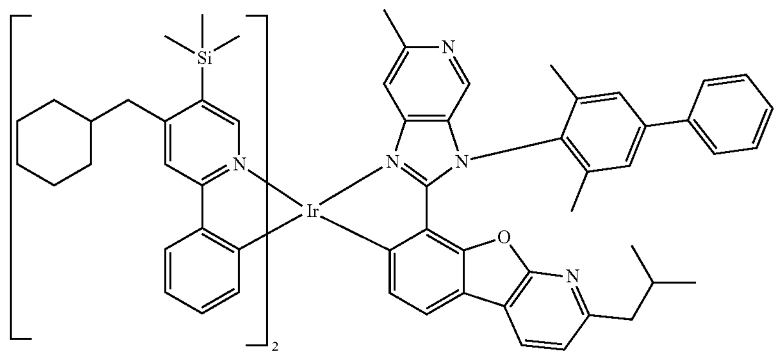
637
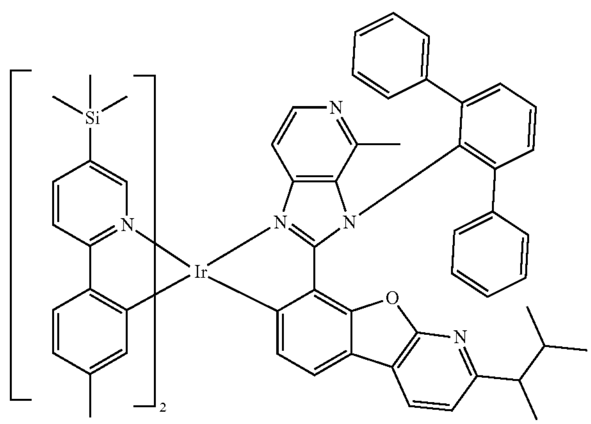
638
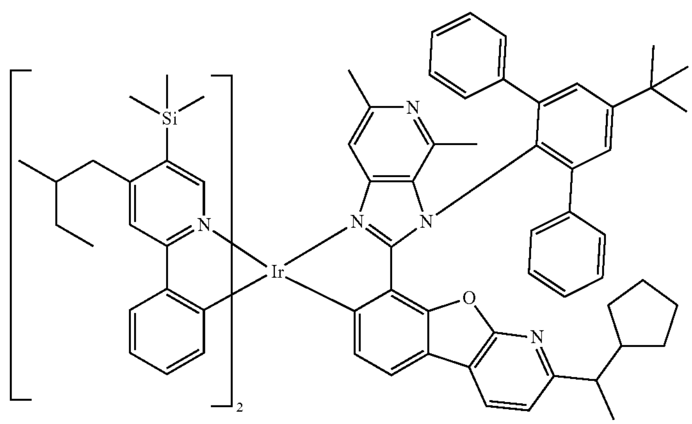
639
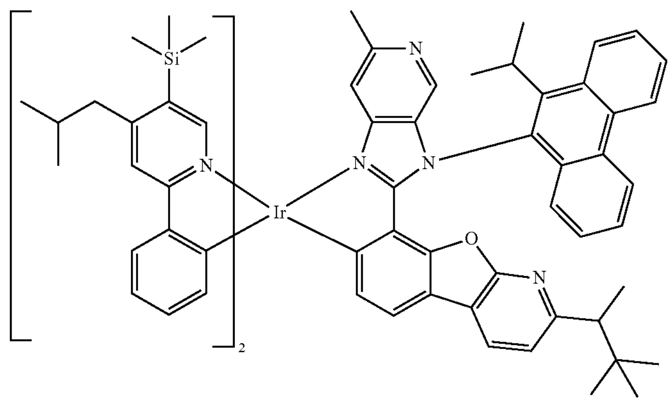

-continued
640
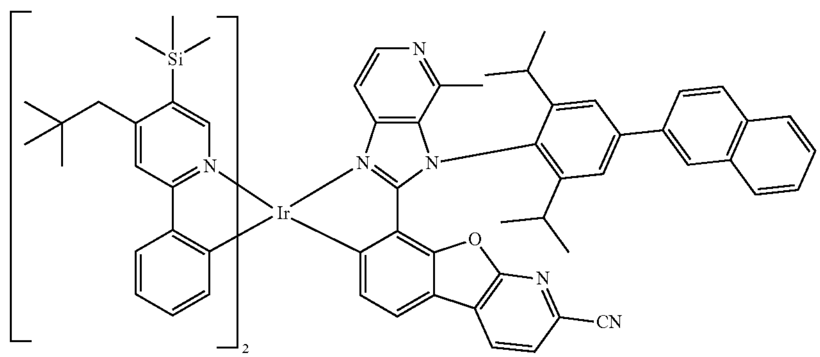
641
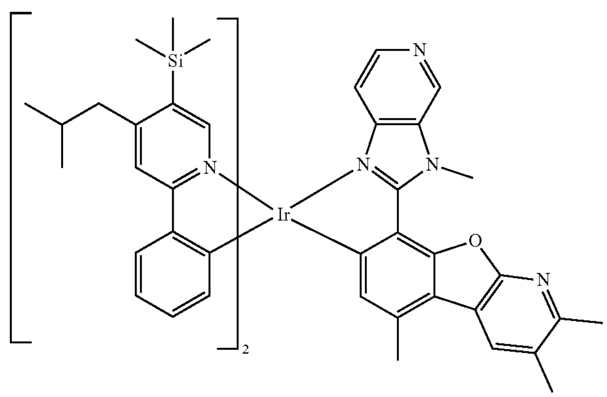
642
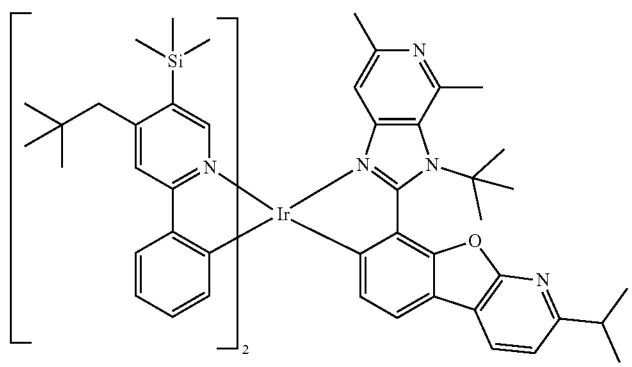
643
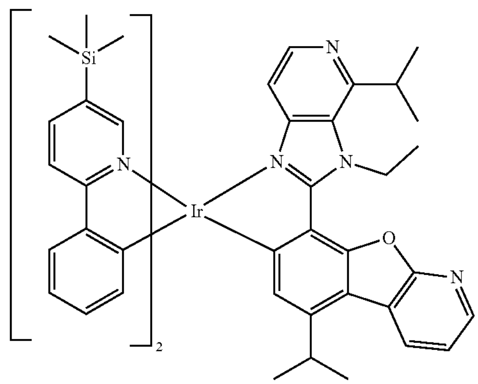

-continued
644
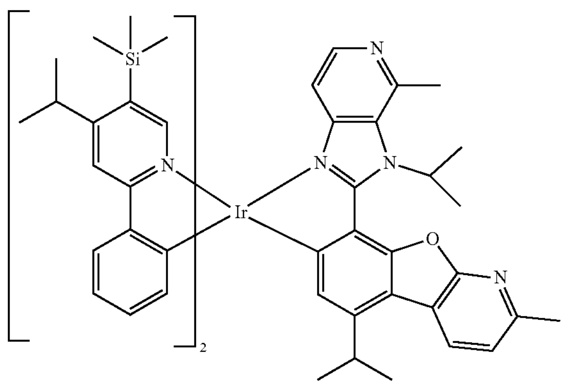
645
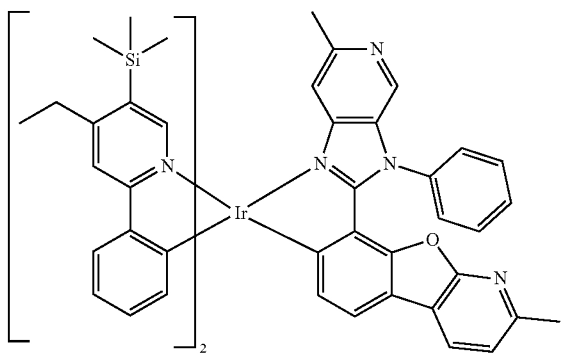
646
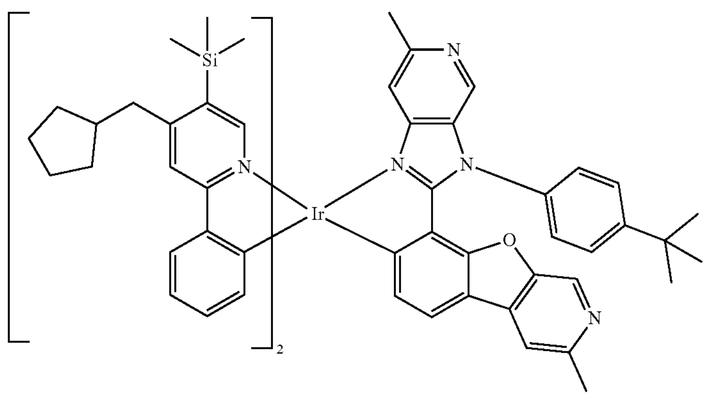
647
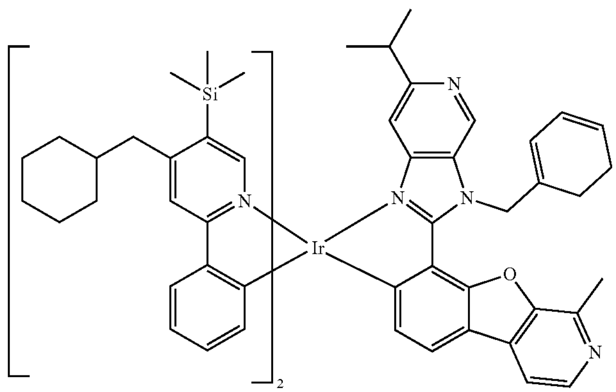

-continued
647
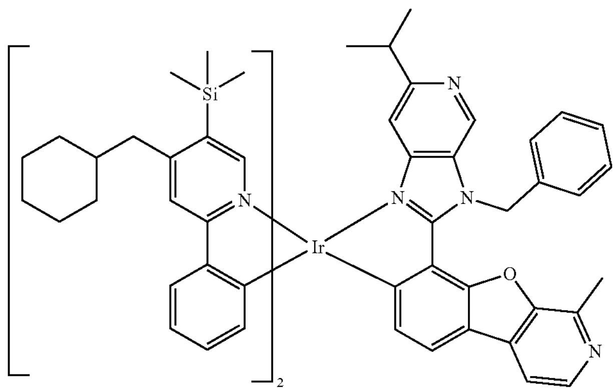
648
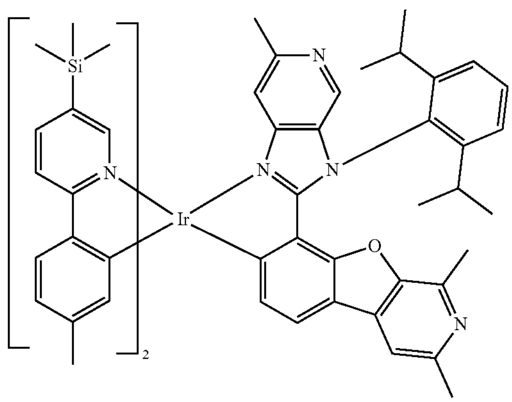
649
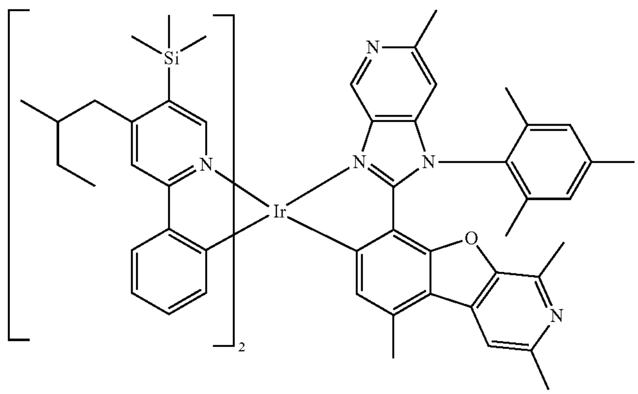
650
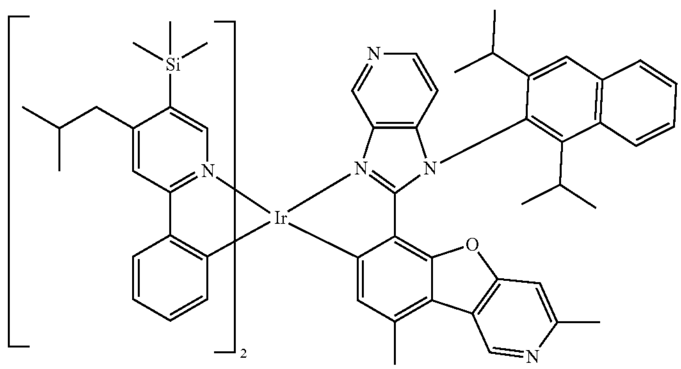

-continued
651
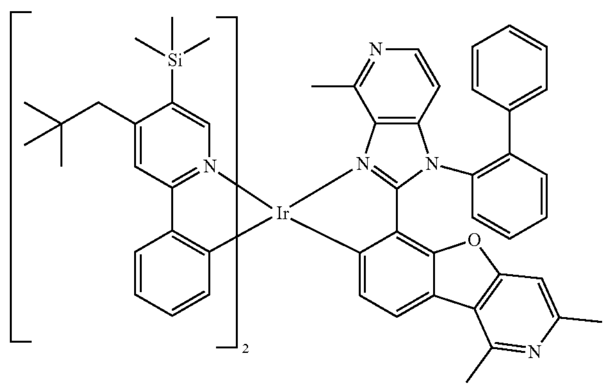
652
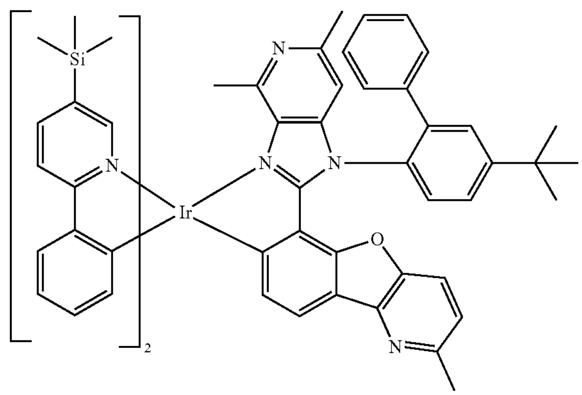
653
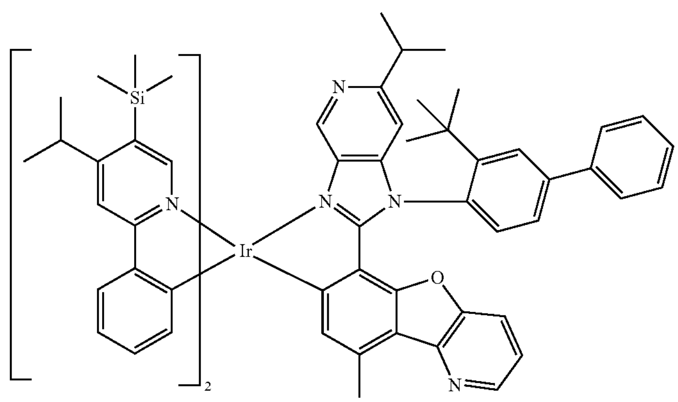
654
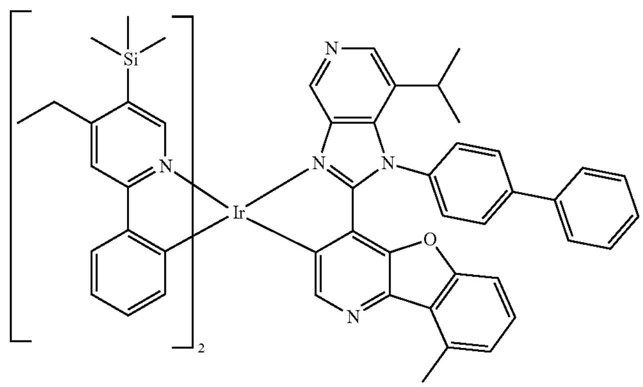

-continued
655
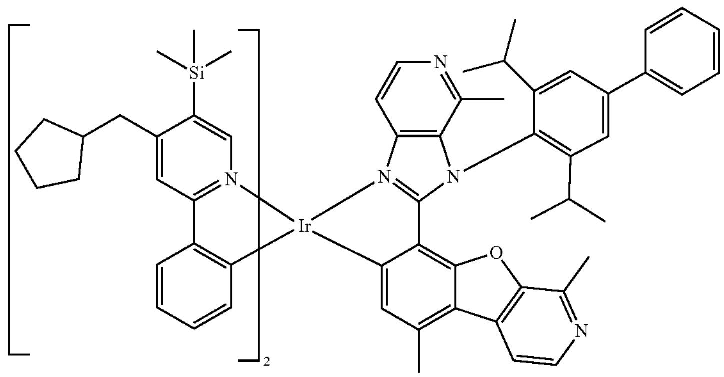
656
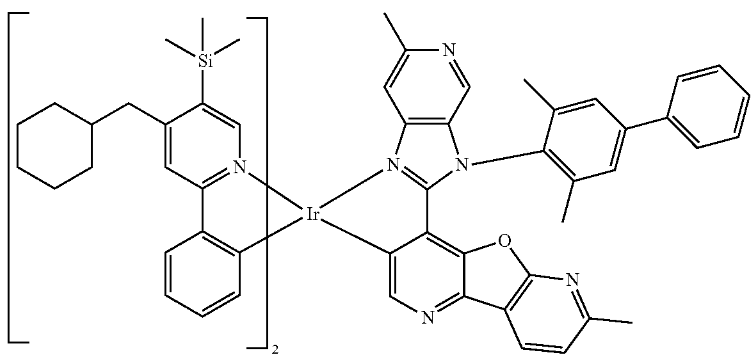
657
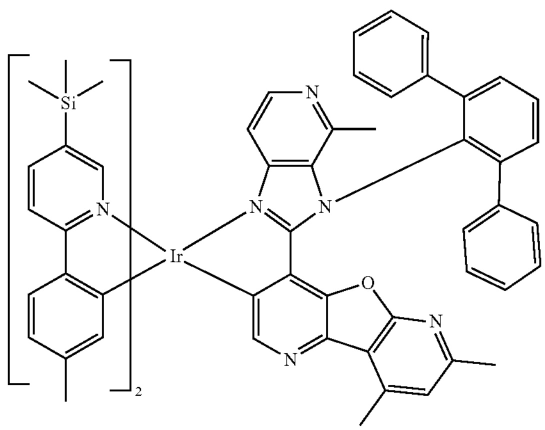
658
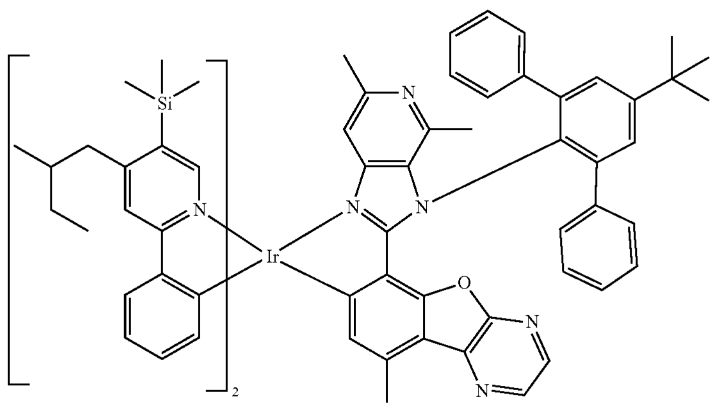

-continued
659
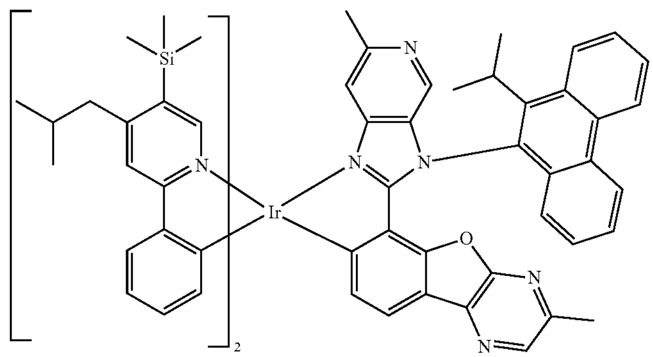
660
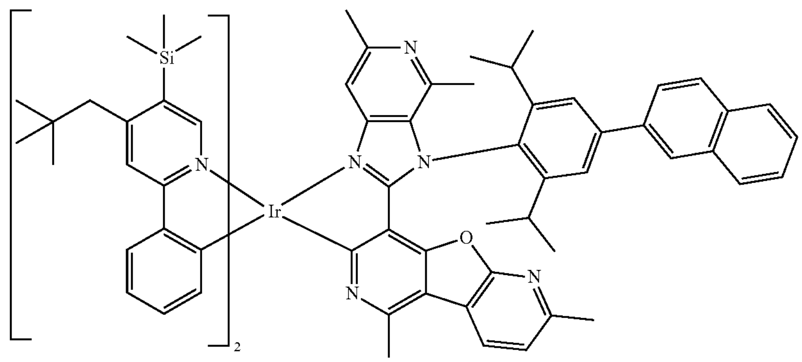
661
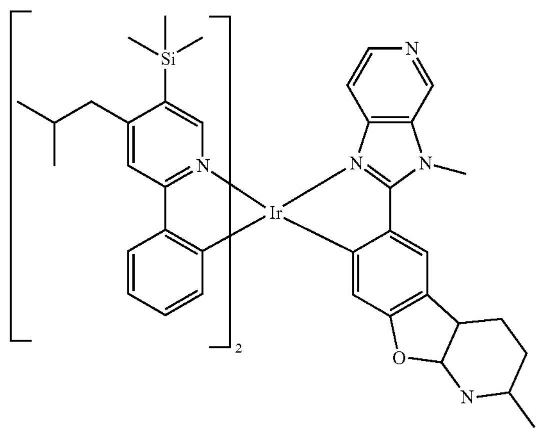
662
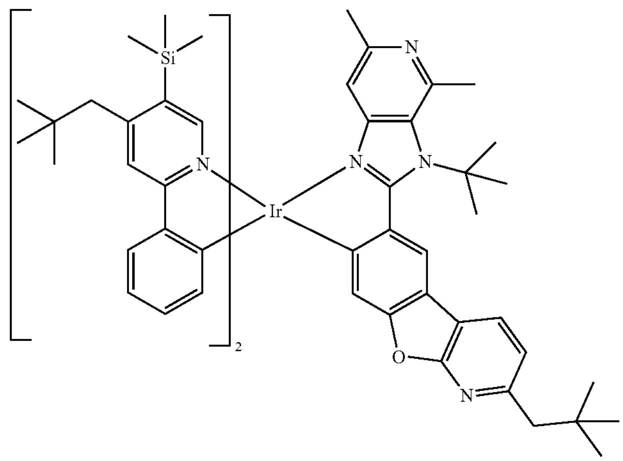

-continued
663
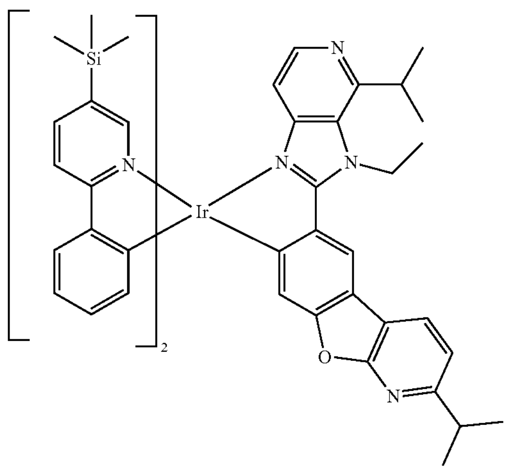
664
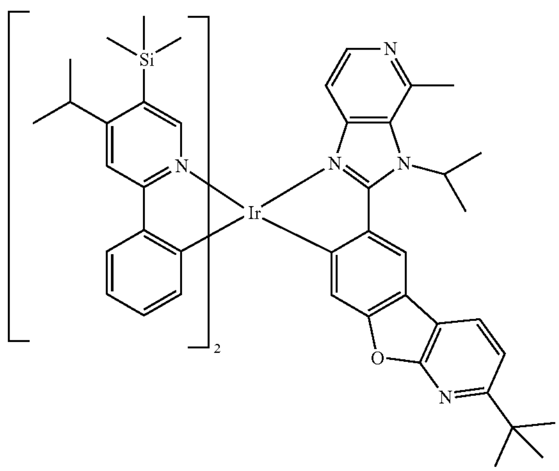
665
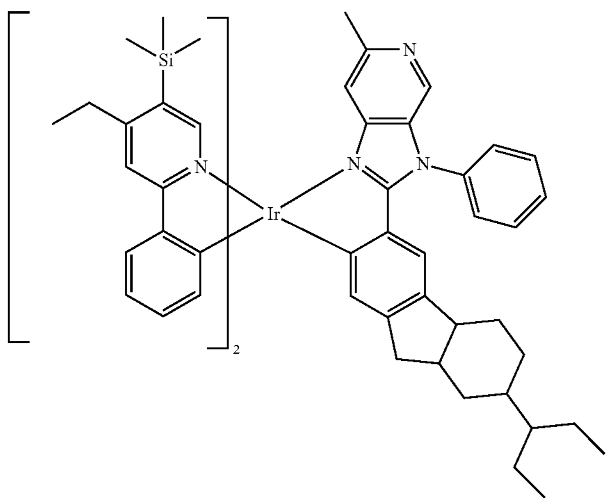

-continued
666
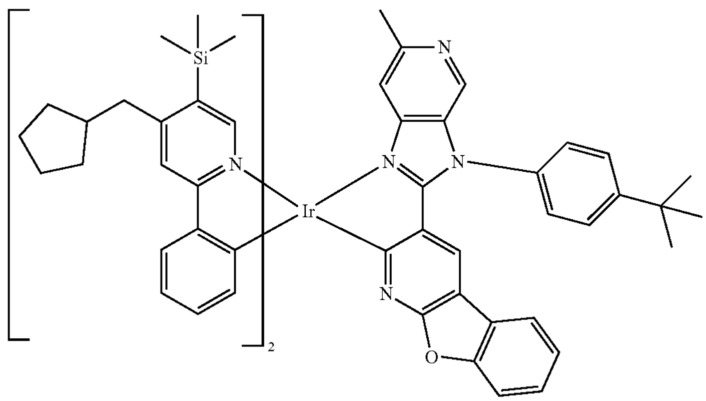
667
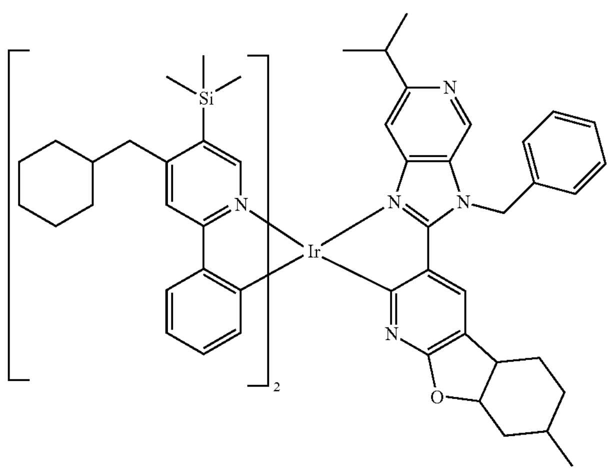
668
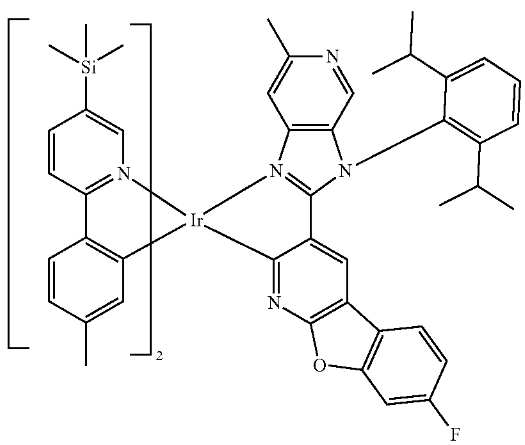

-continued
669
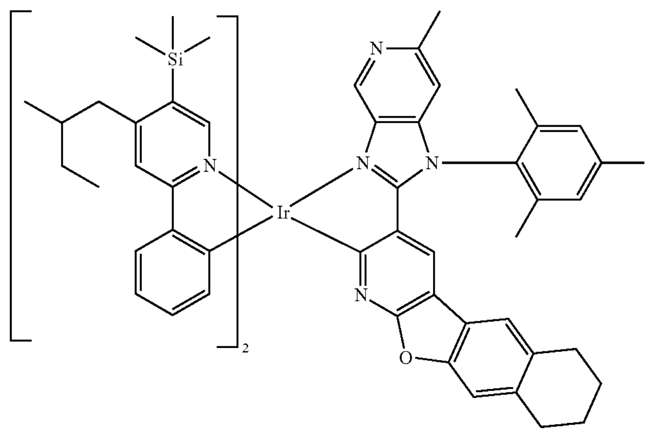
670
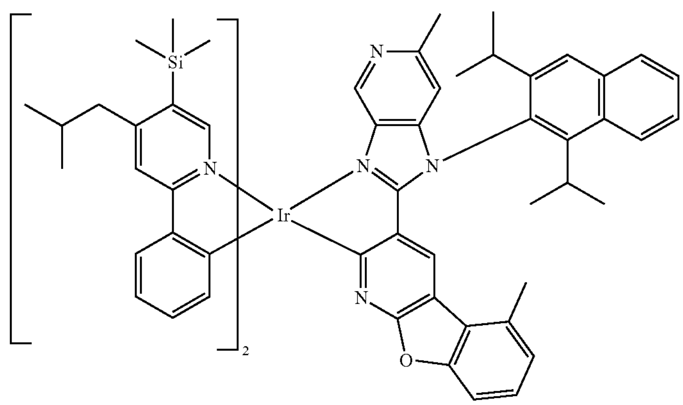
671
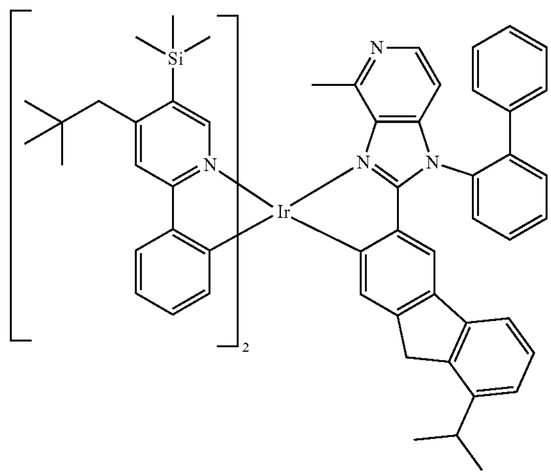

-continued
672
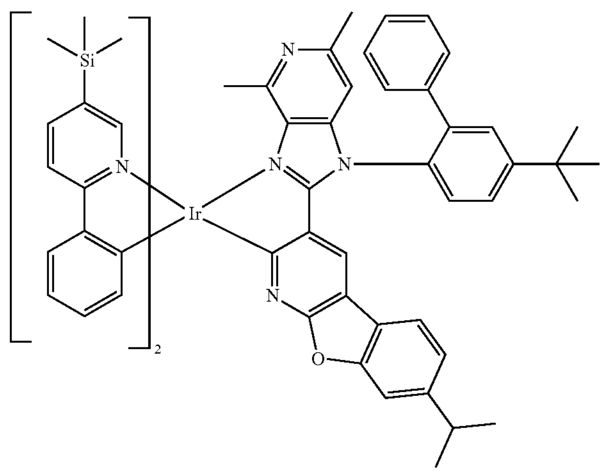
673
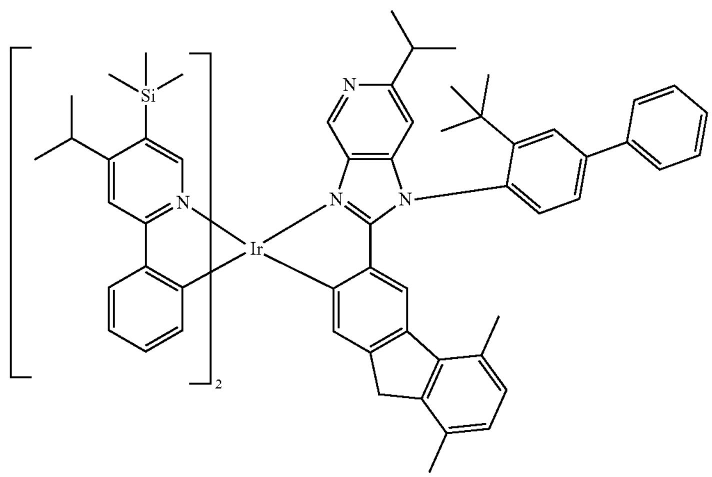
674
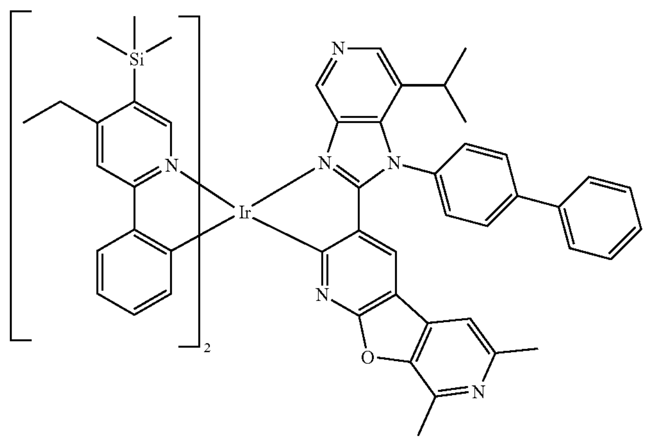

-continued
675
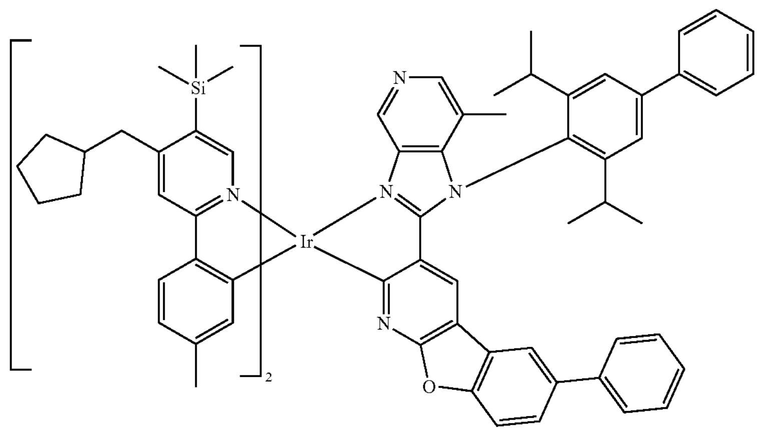
675
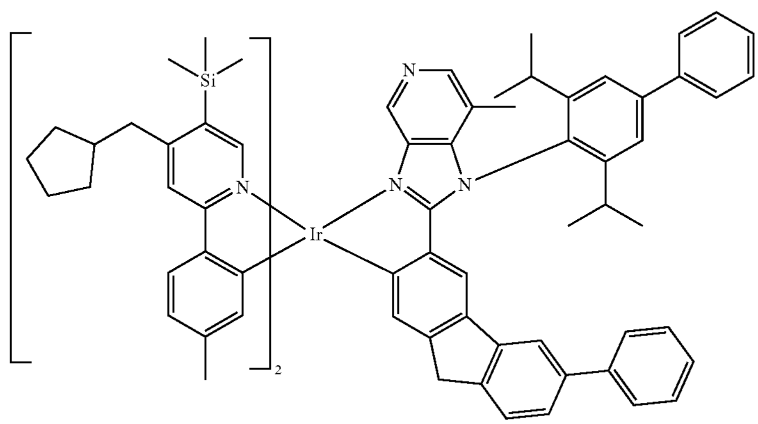
676
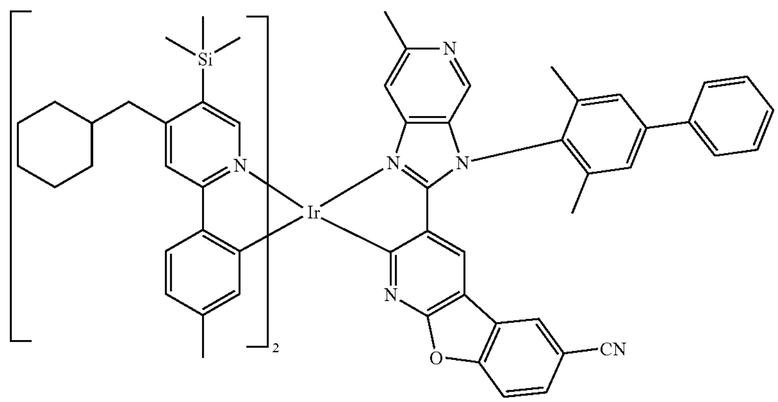

-continued
677
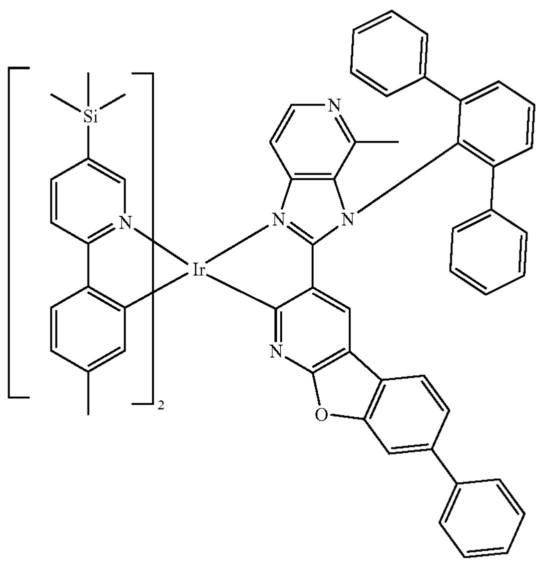
678
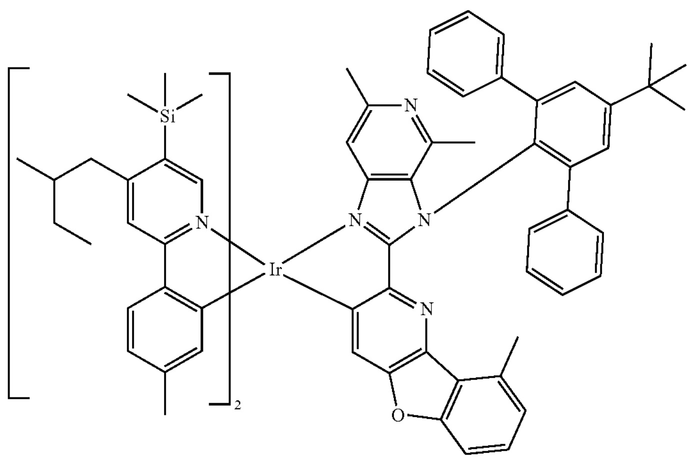
679
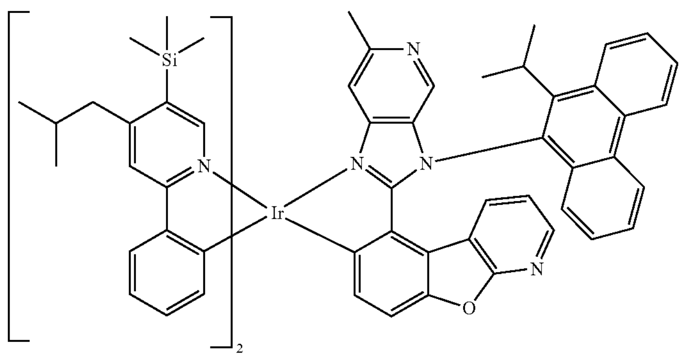

-continued
680
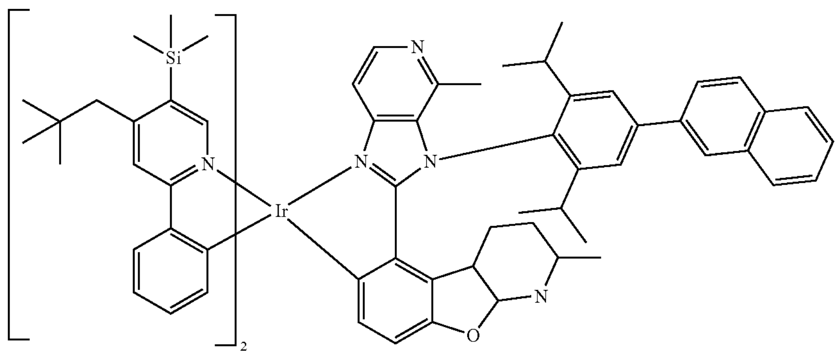
681
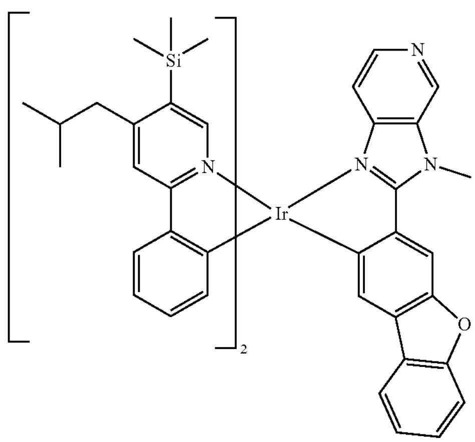
682
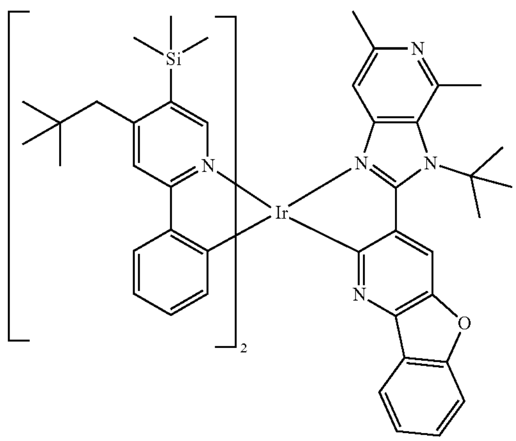

-continued
683
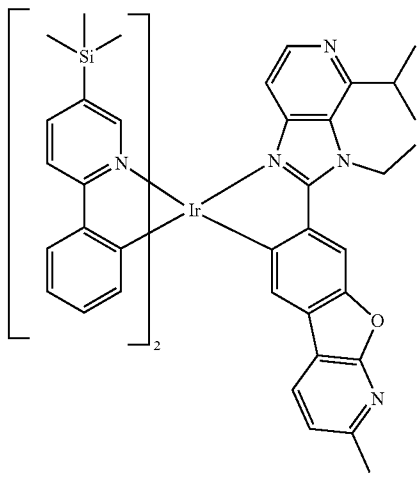
684
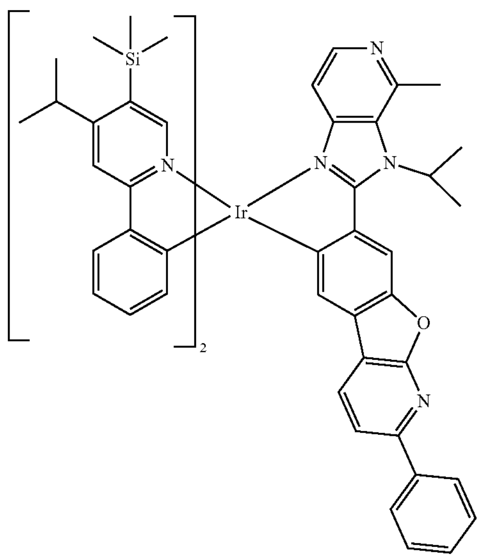
685
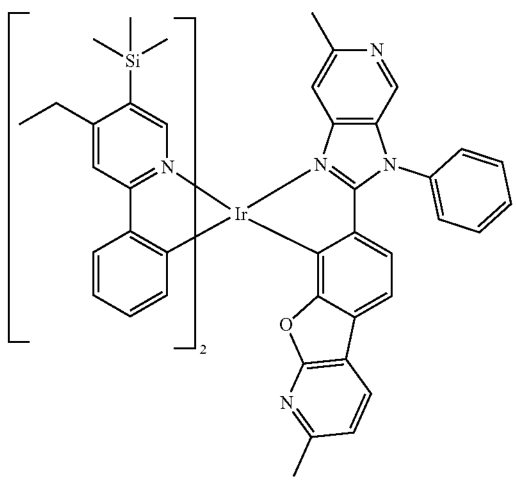

-continued
686
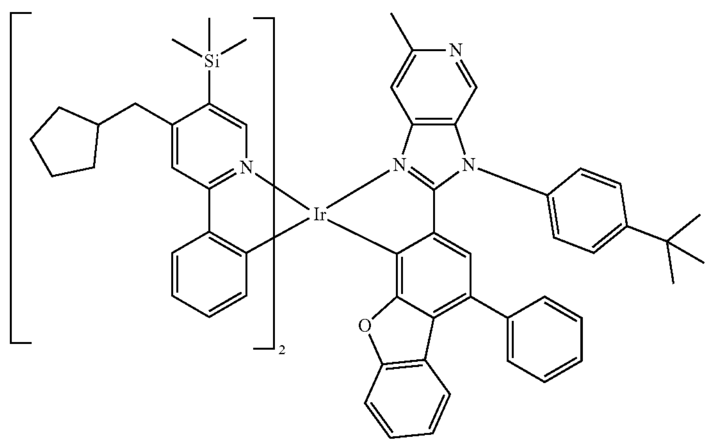
687
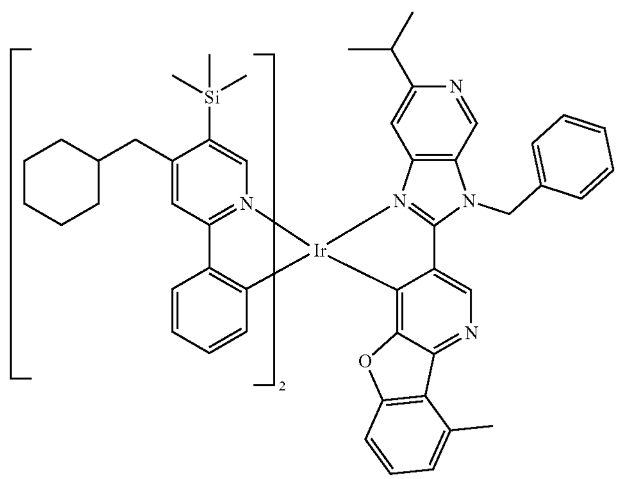
688
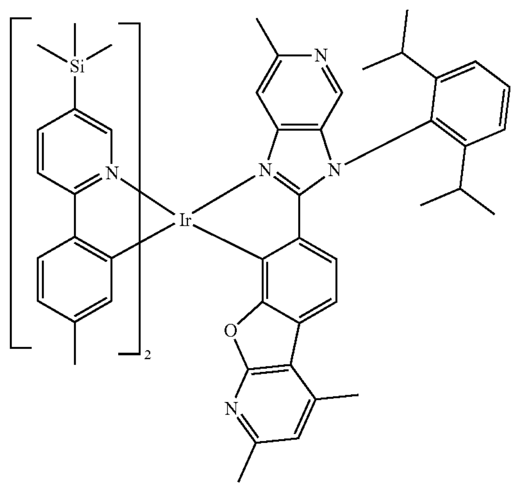

-continued
689
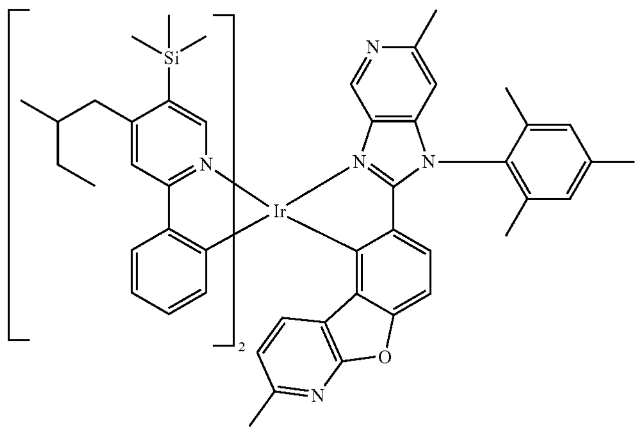
690
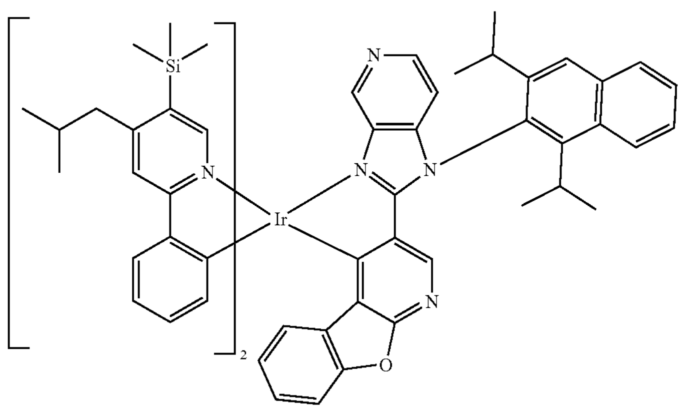
691
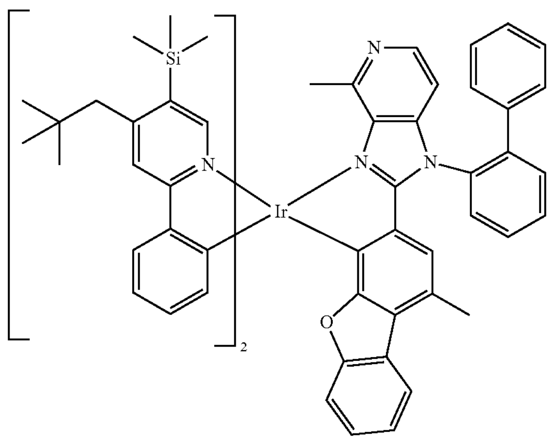

-continued
692
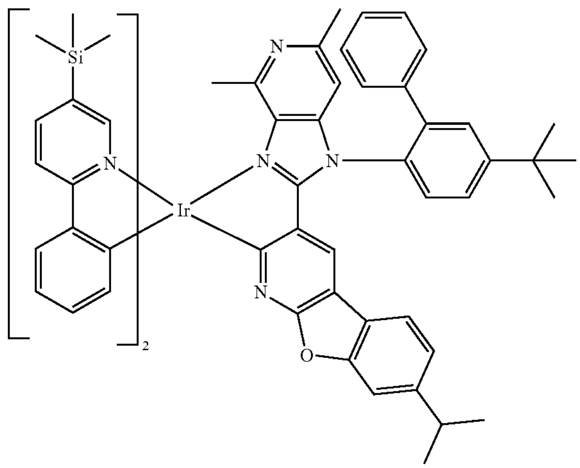
693
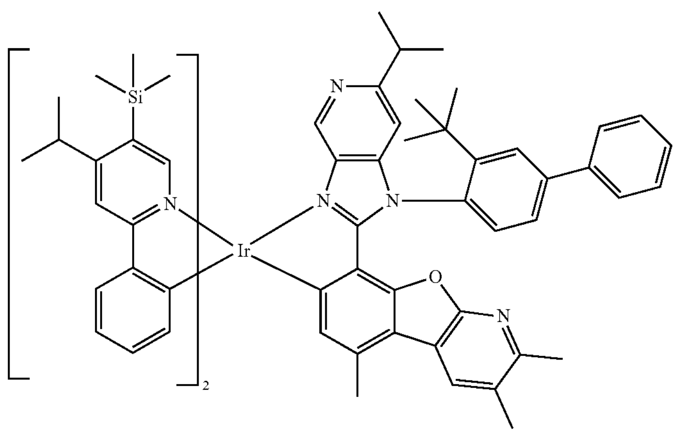
694
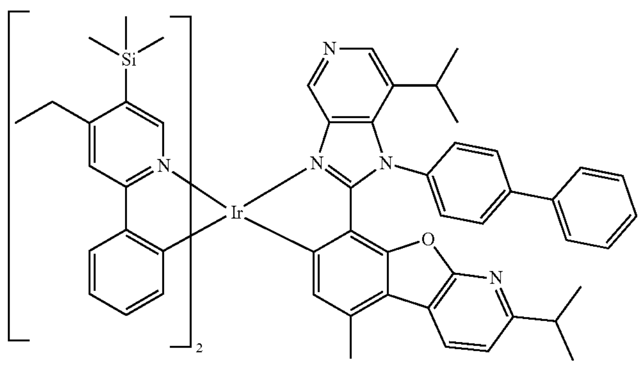

-continued
695
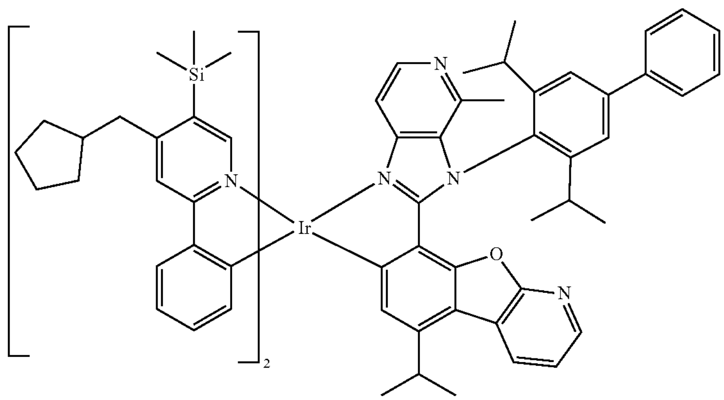
696
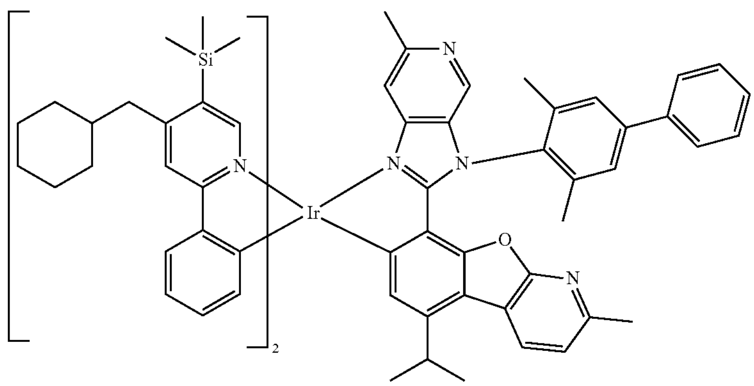
697
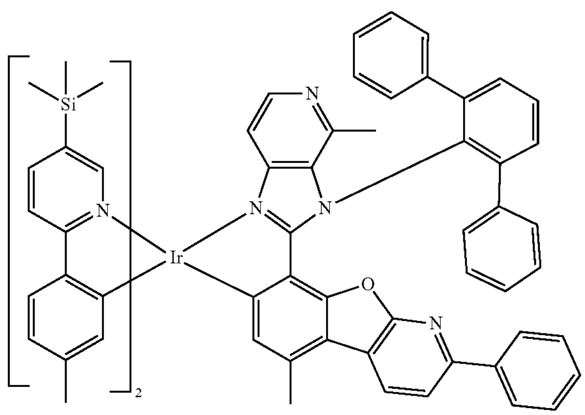
698
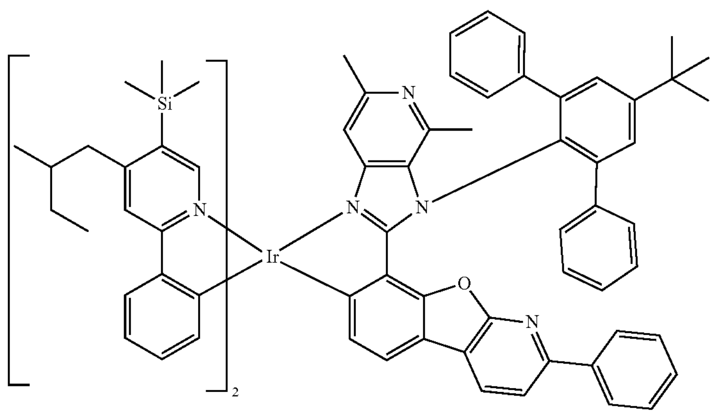

-continued
699
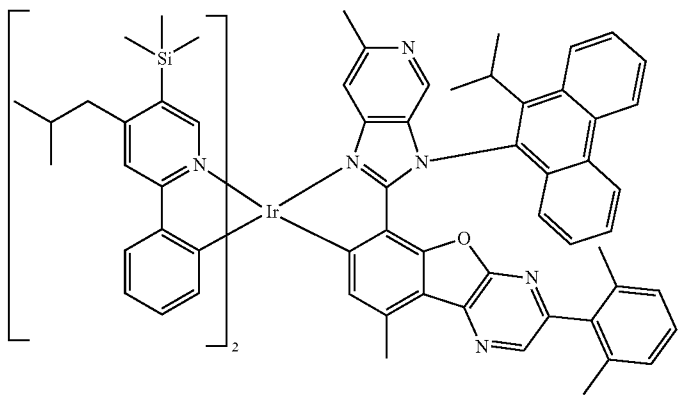
700
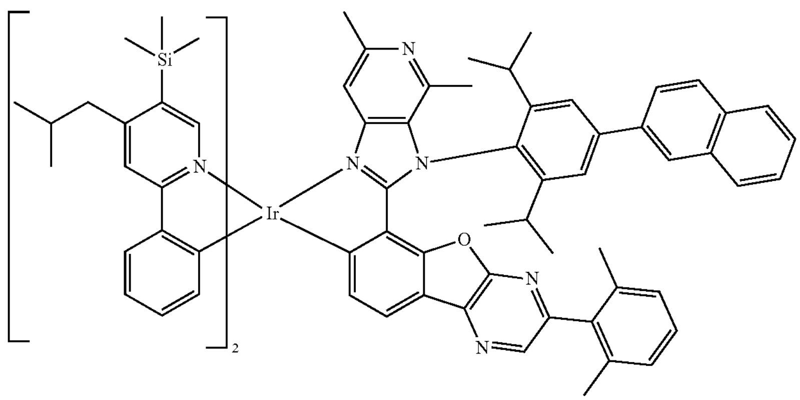
701
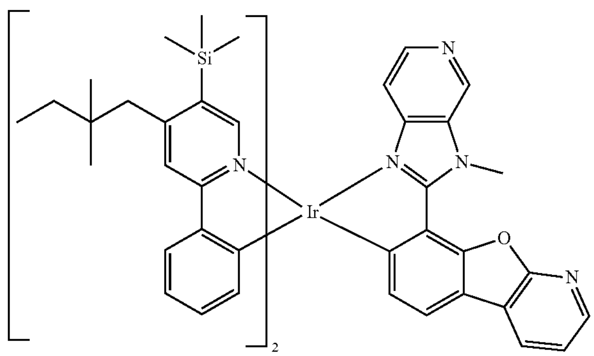
702
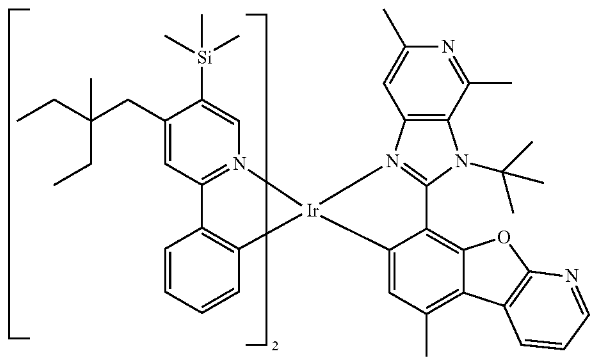

-continued
703
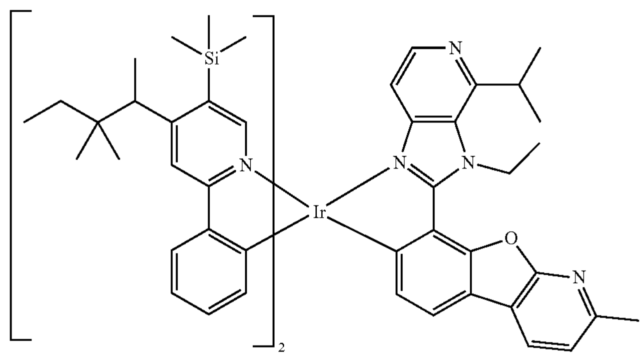
704
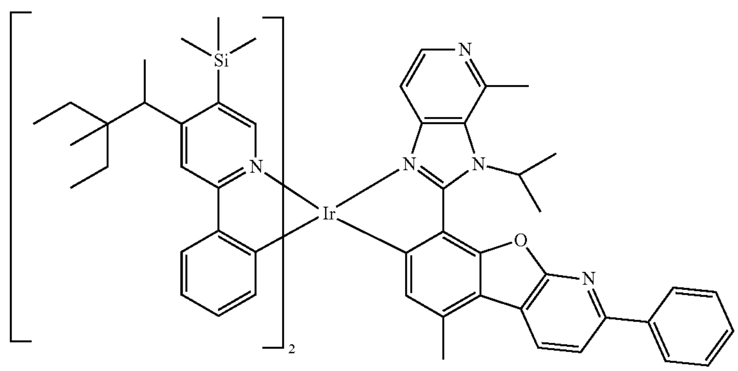
705
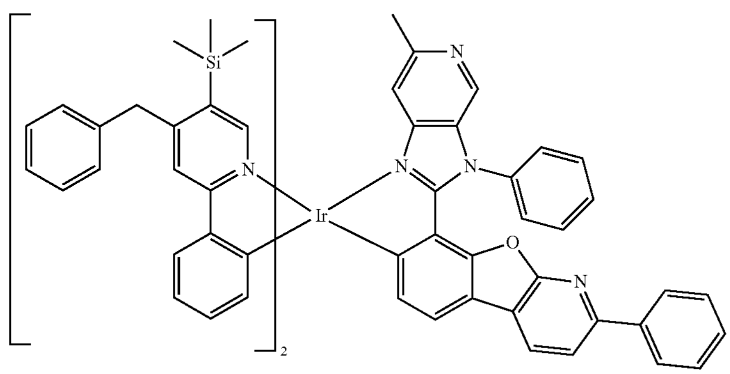
706
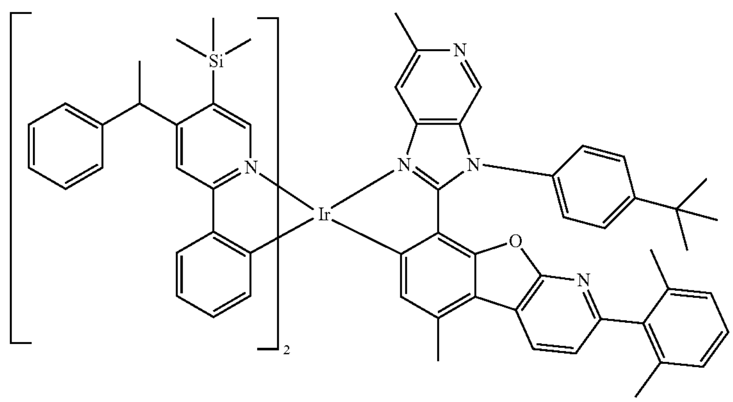

-continued
707
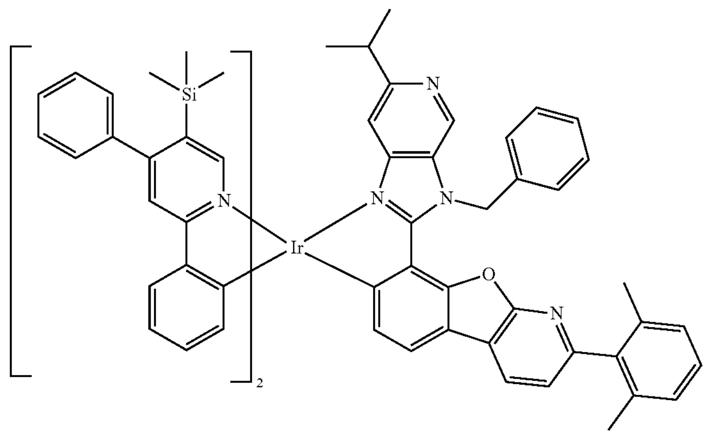
708
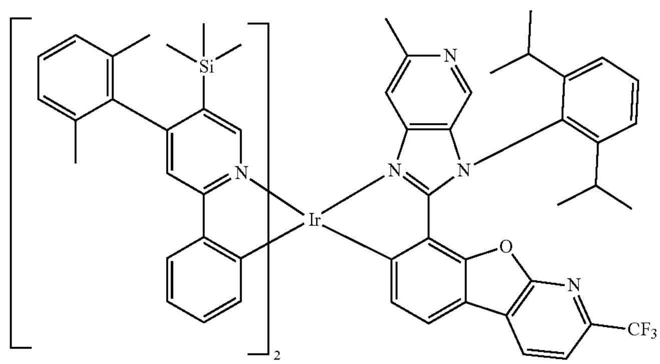
709
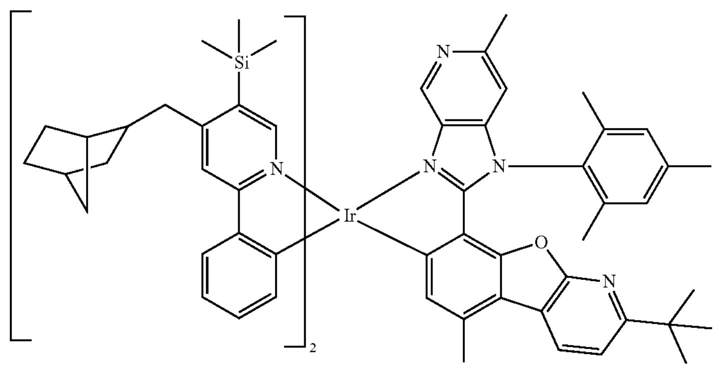
710
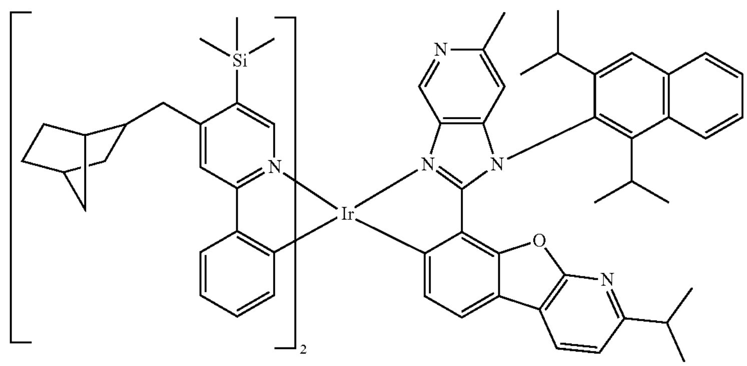

-continued
711
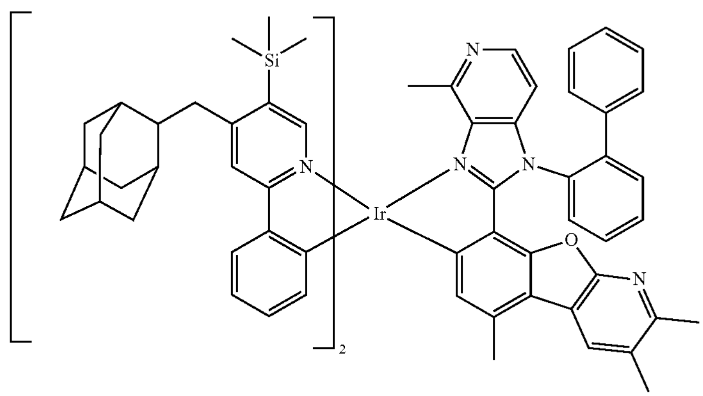
712
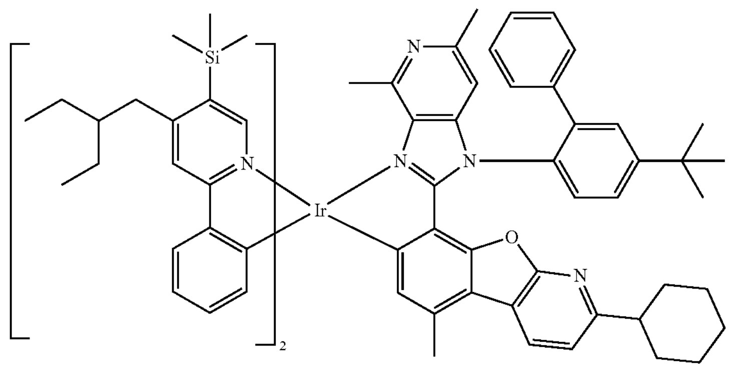
713
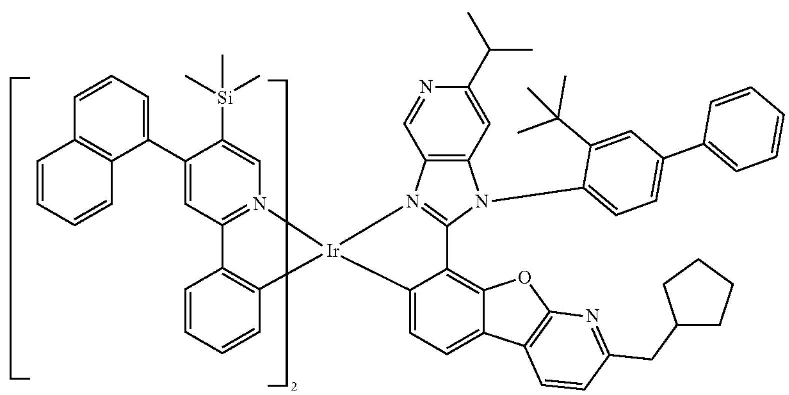
714
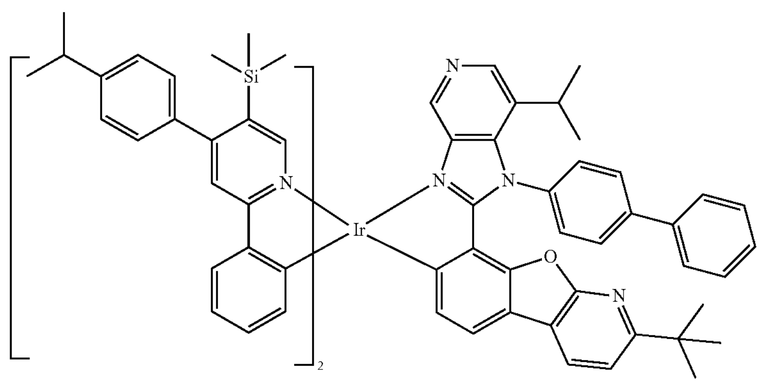

-continued
715
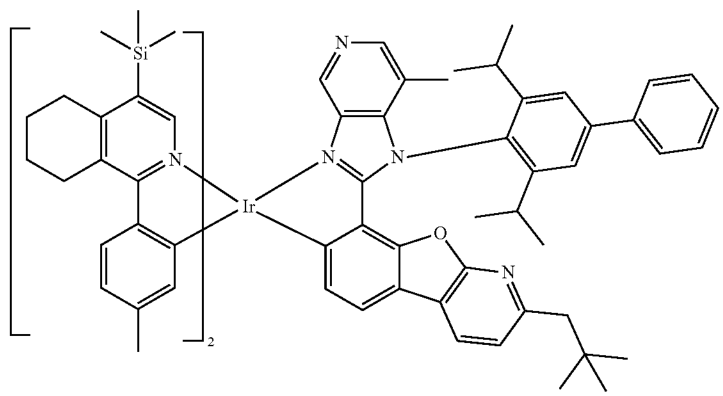
716
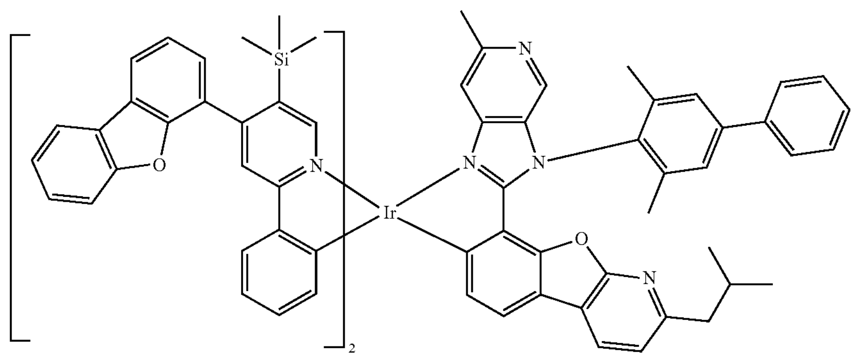
717
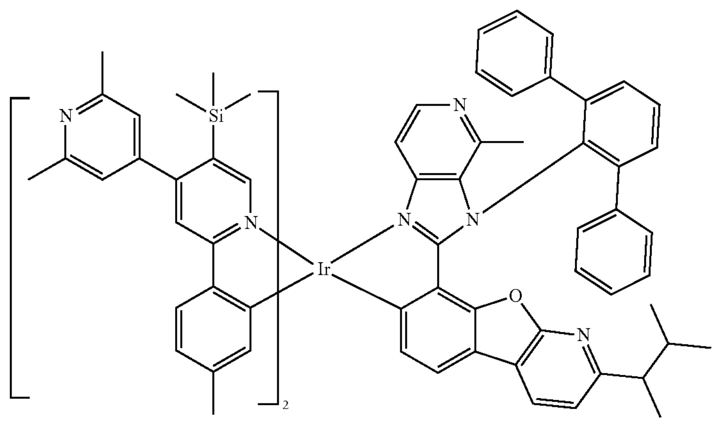

-continued
718
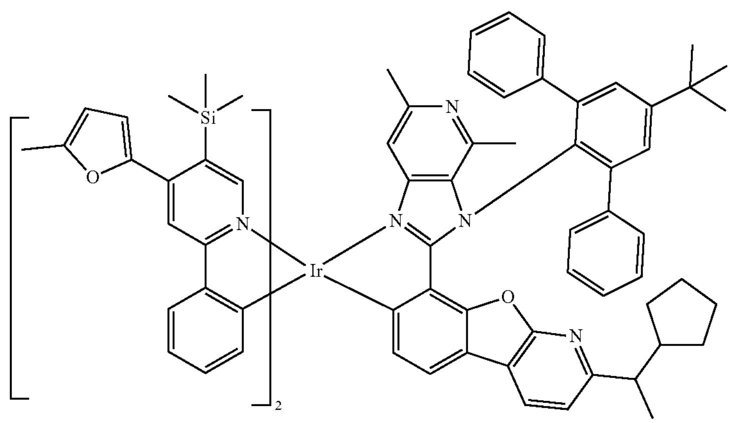
719
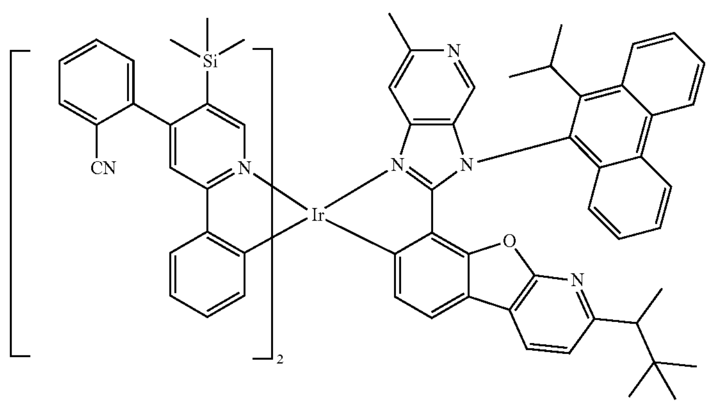
720
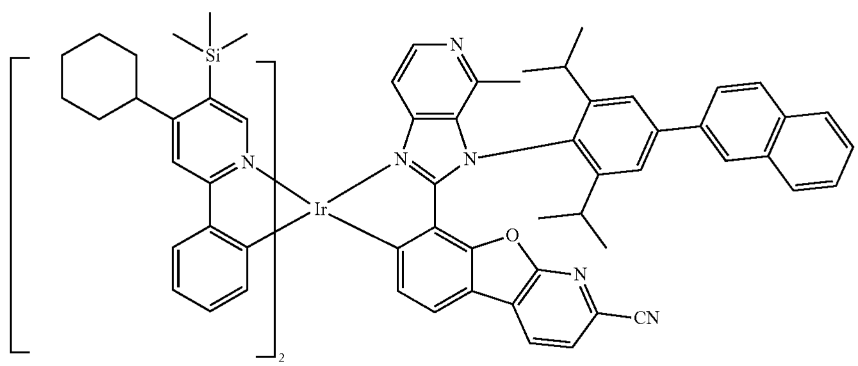
721
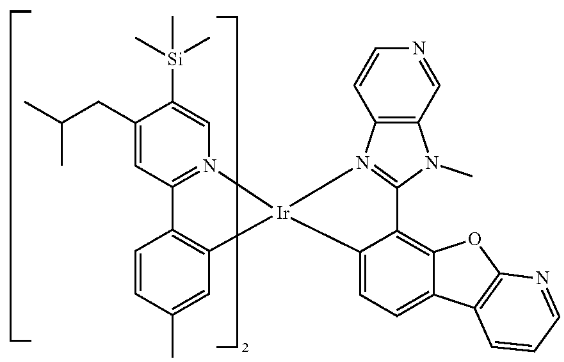

-continued
722
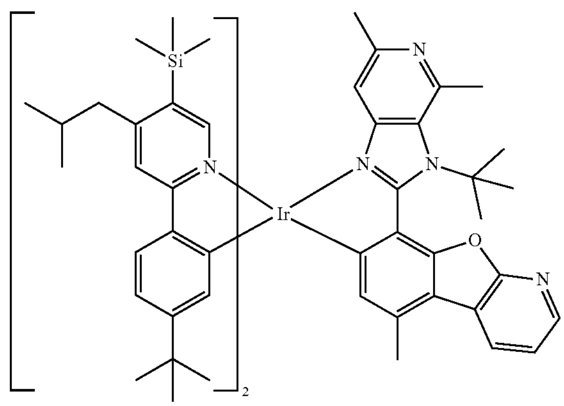
723
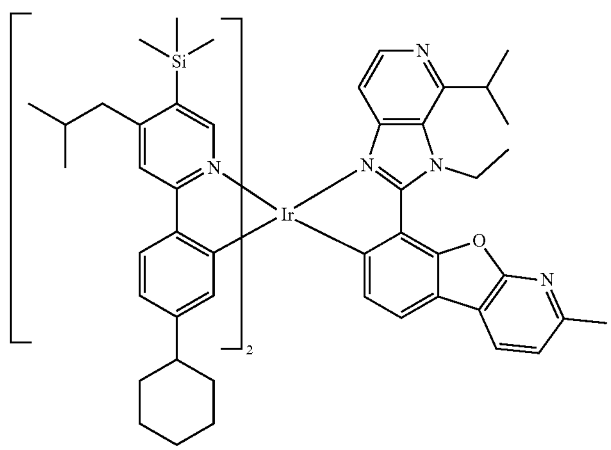
724
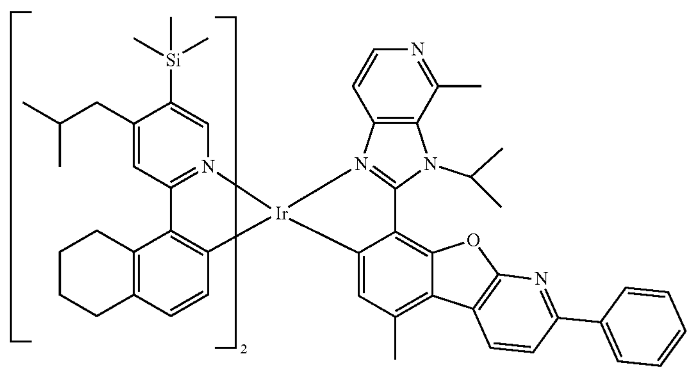

-continued
725
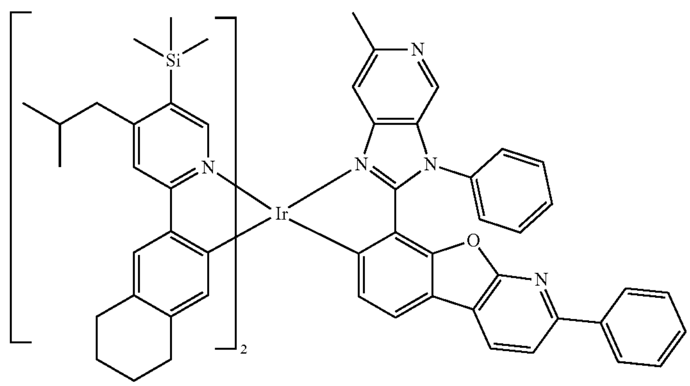
726
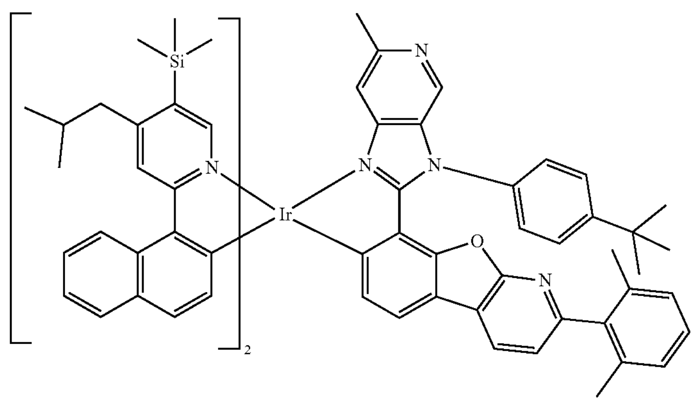
727
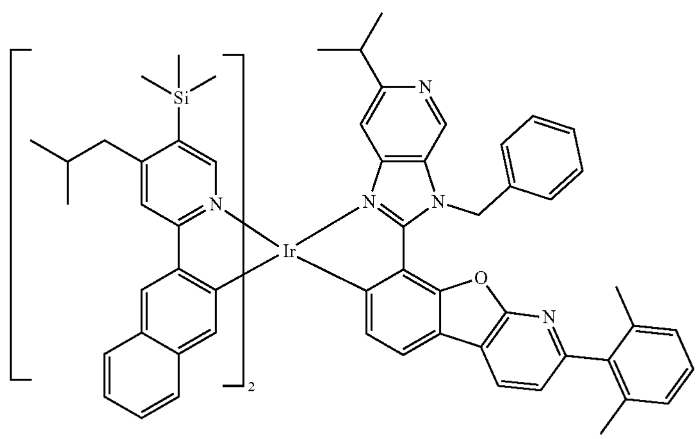
728
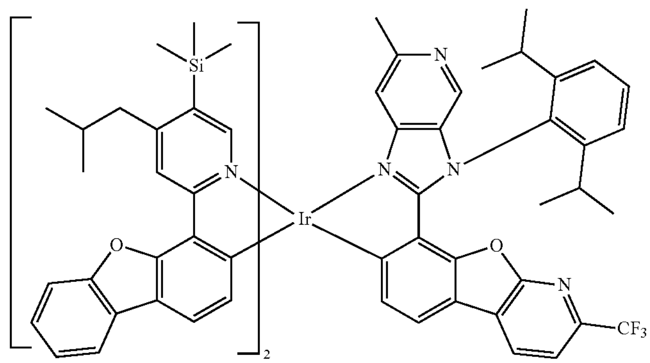

-continued
729
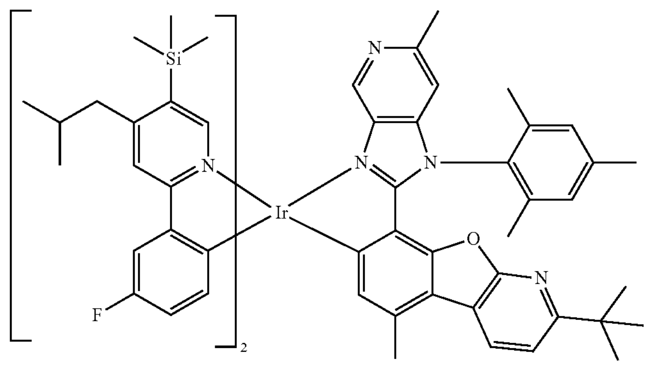
730
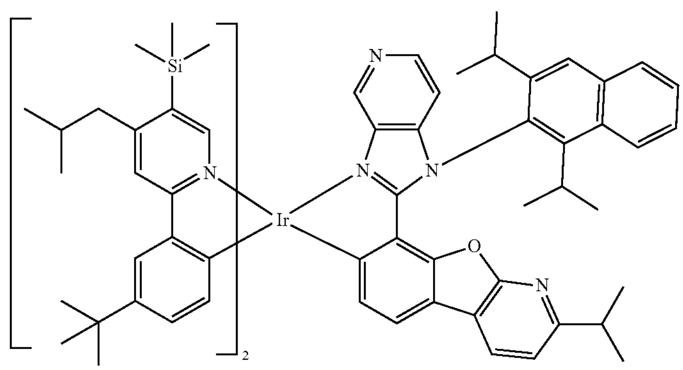
731
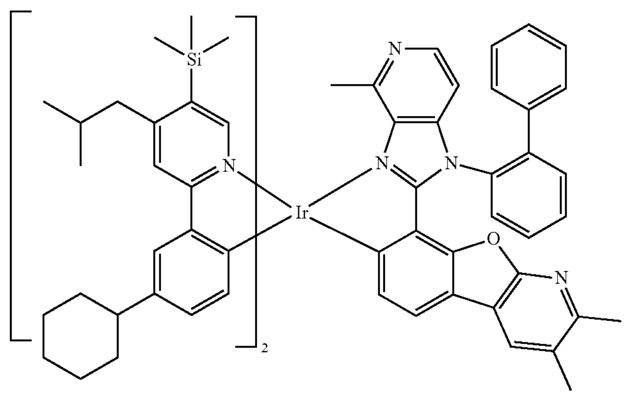
732
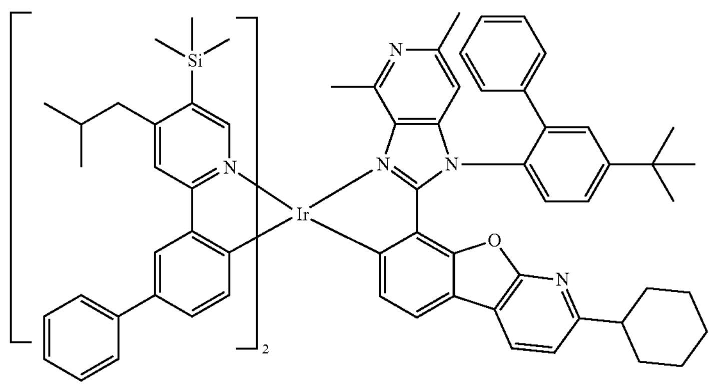

-continued
733
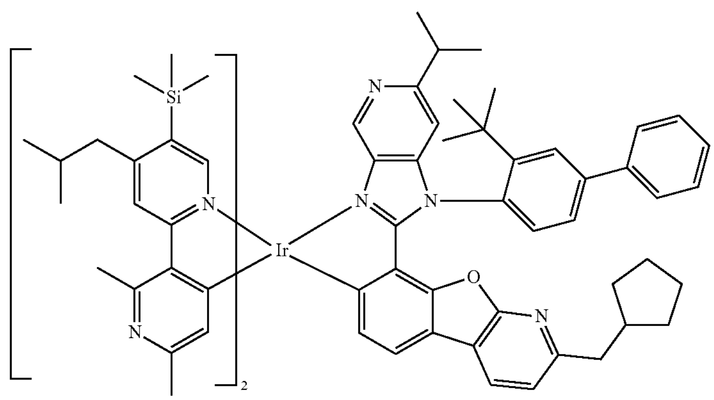
734
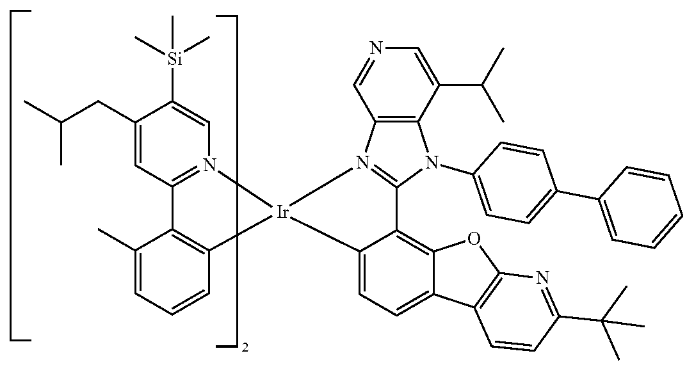
735
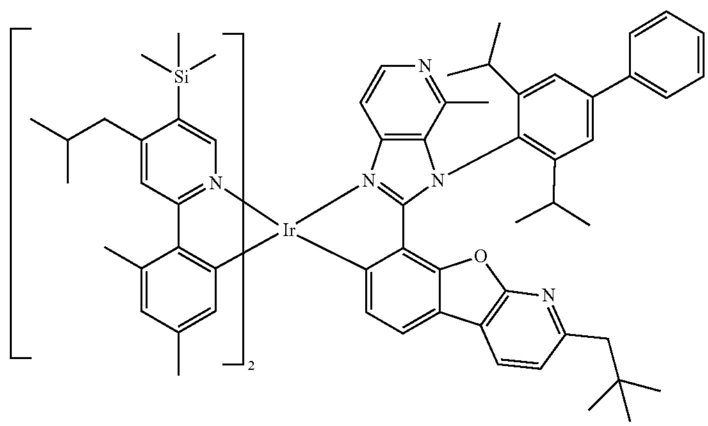
736
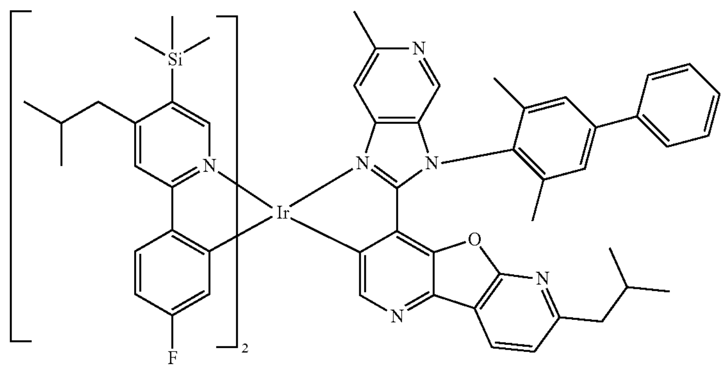

-continued
737
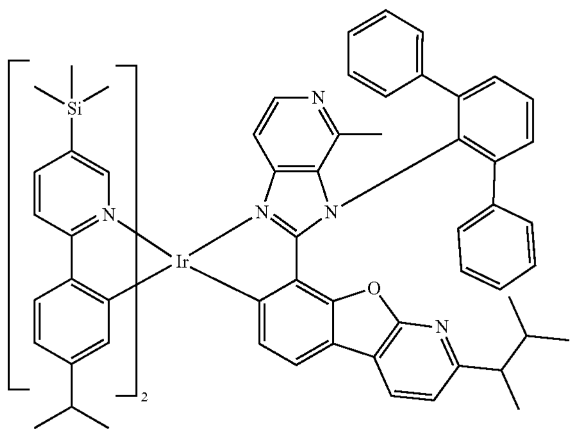
738
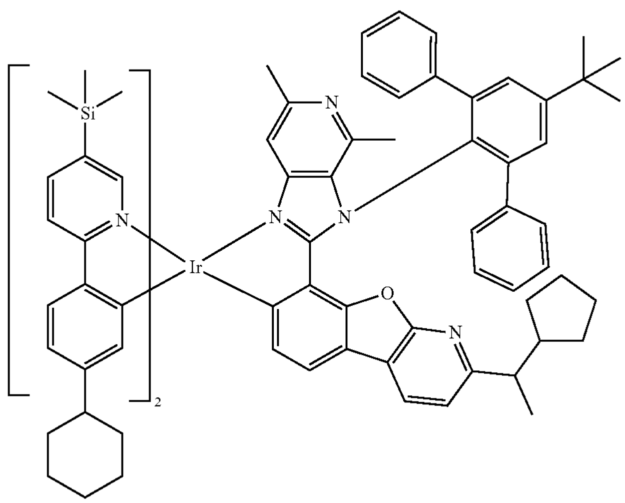
739
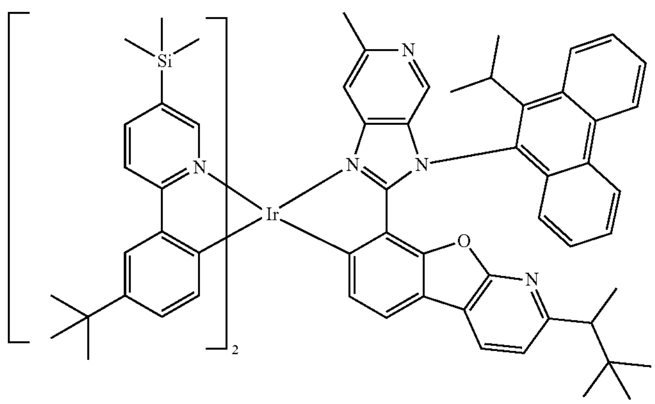

-continued
740
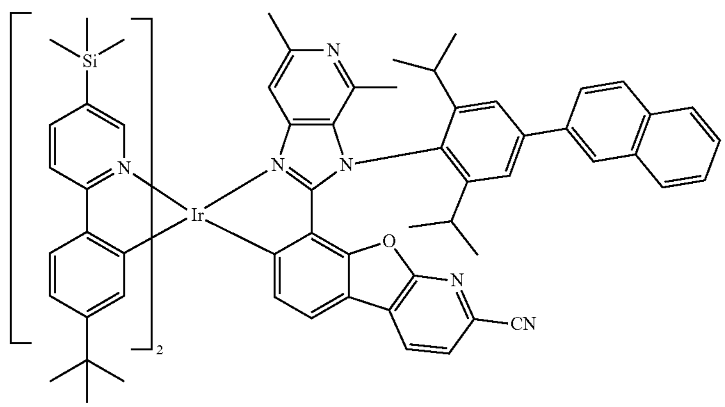
741
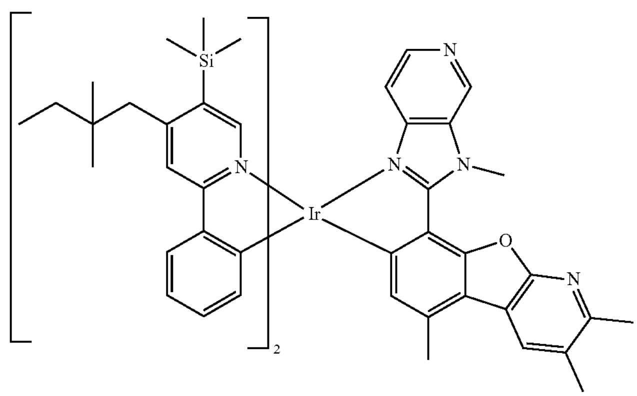
742
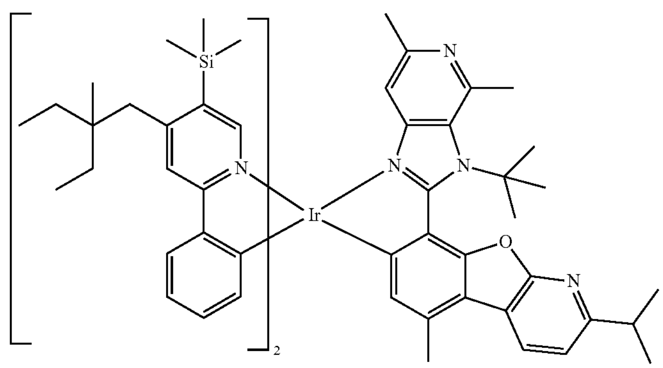
743
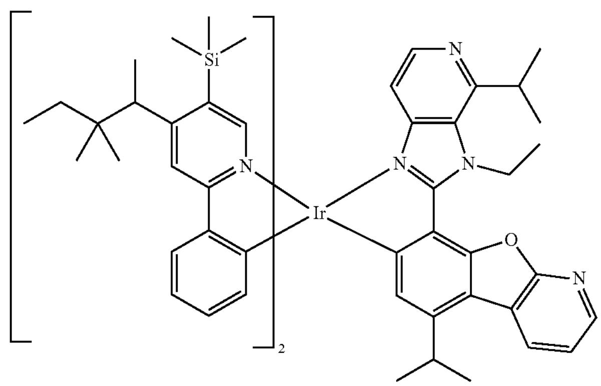

-continued
744
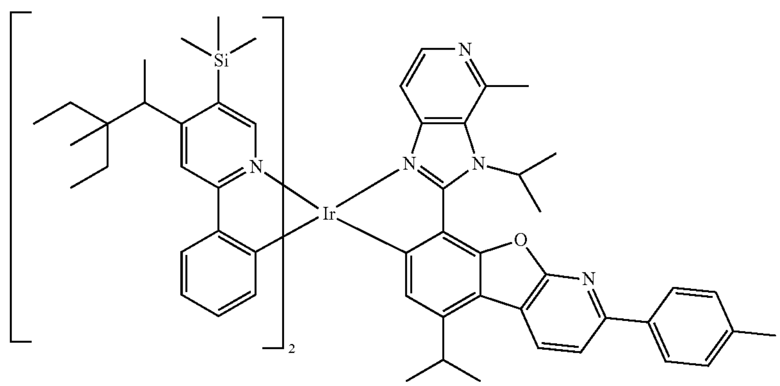
745
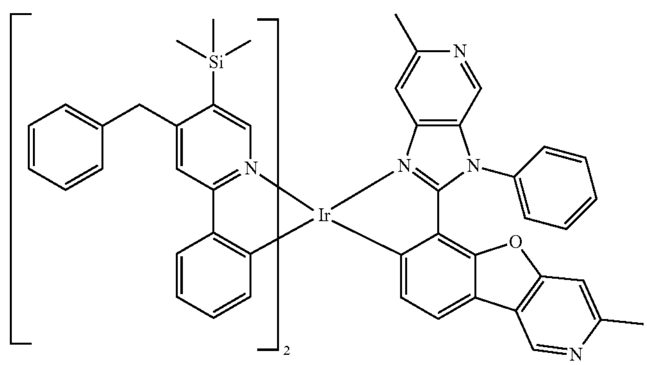
746
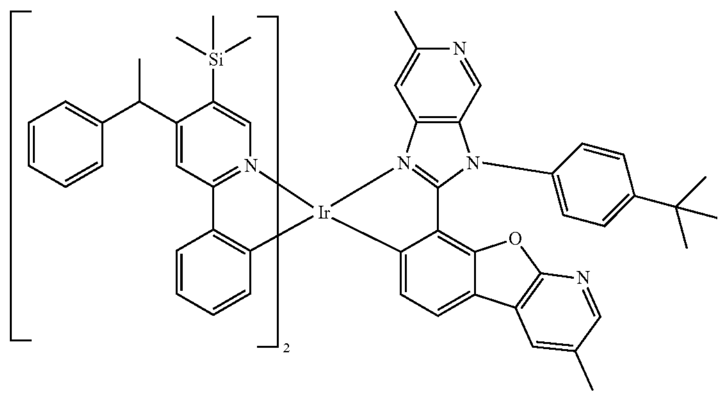
747
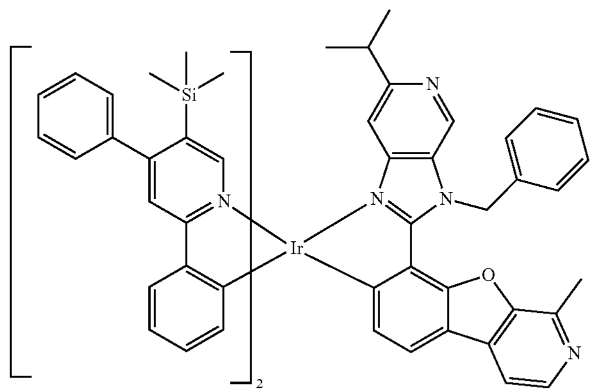

-continued
748
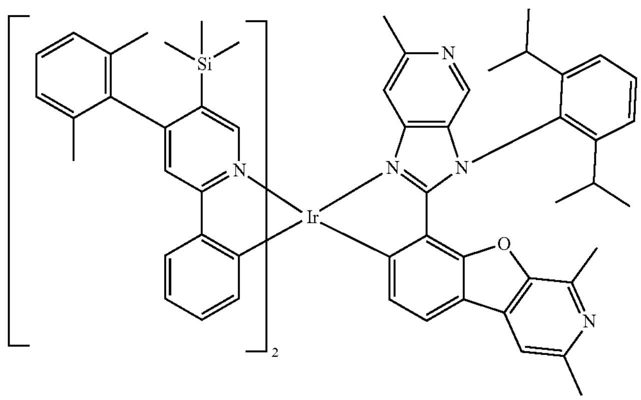
749
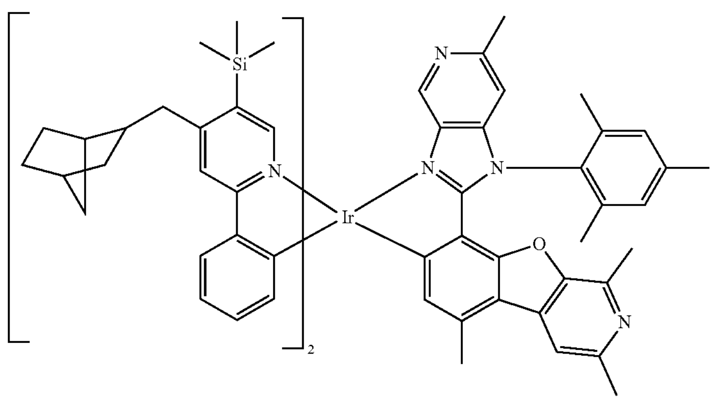
750
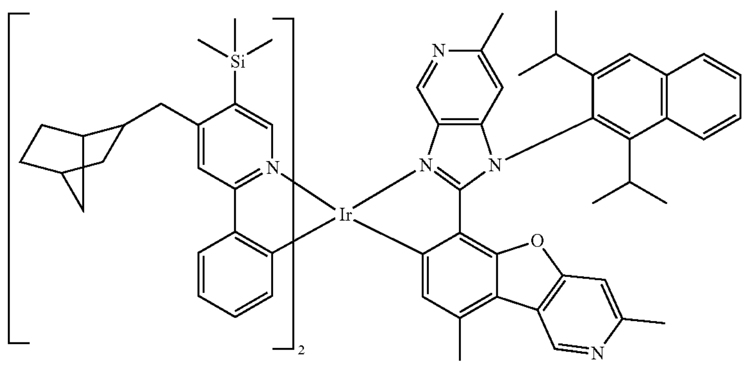
751
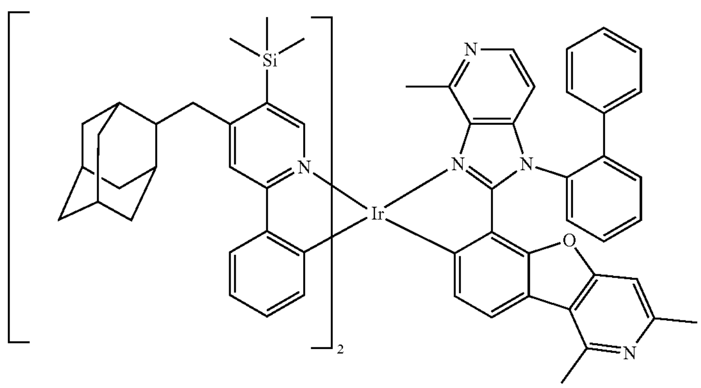

-continued
752
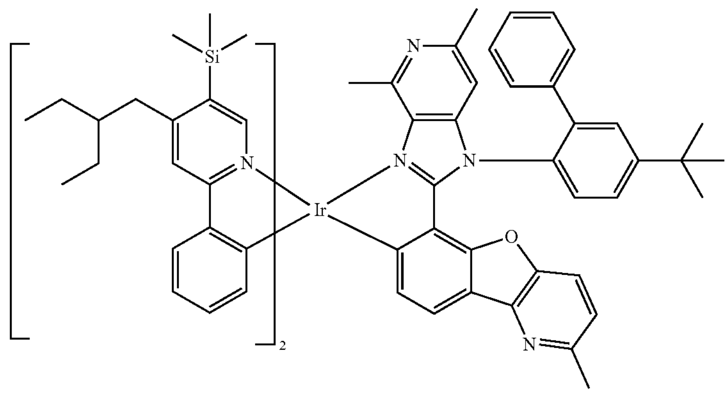
753
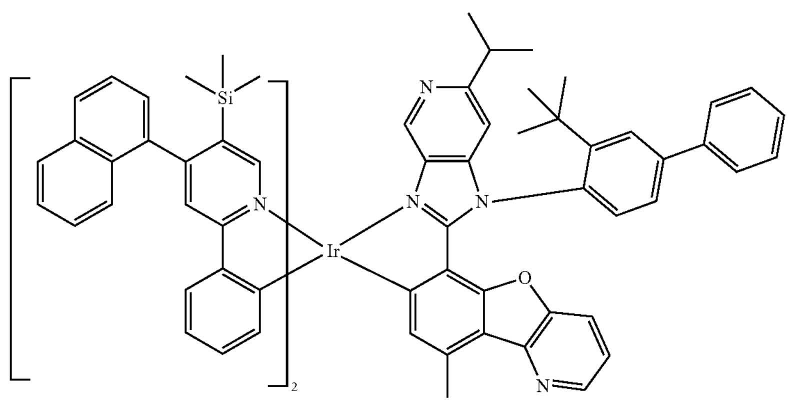
754
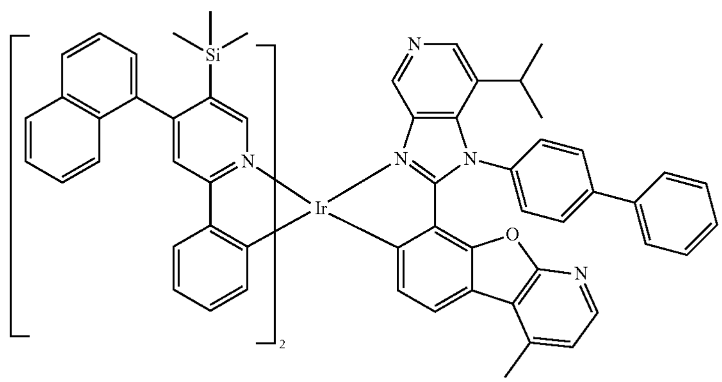
755
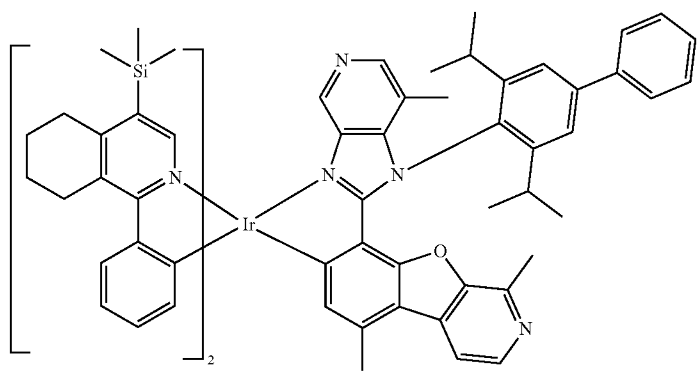

-continued
756
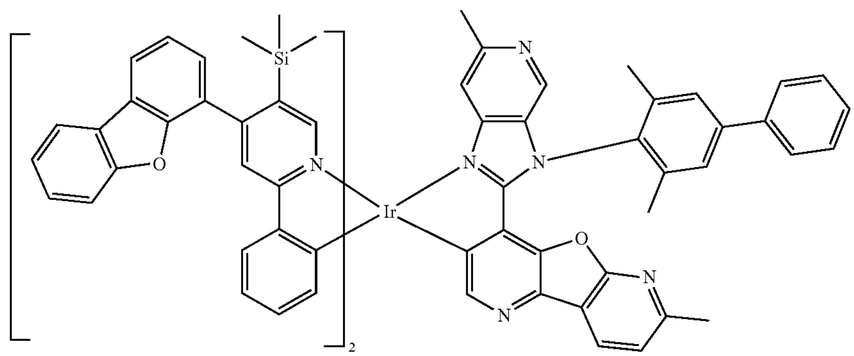
757
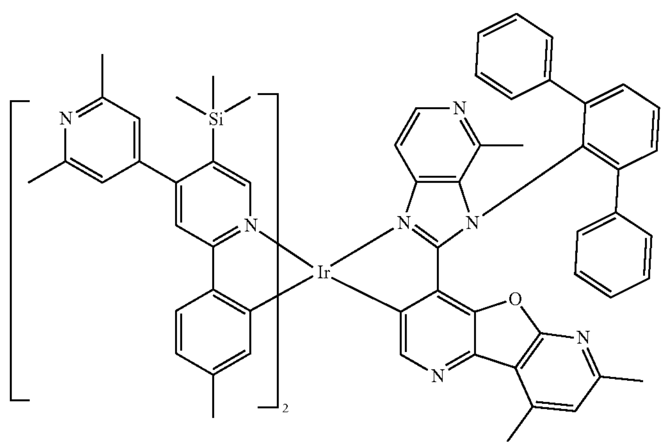
758
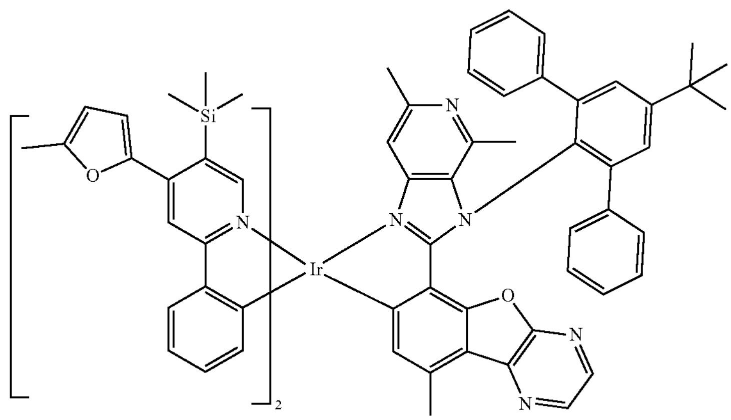
759
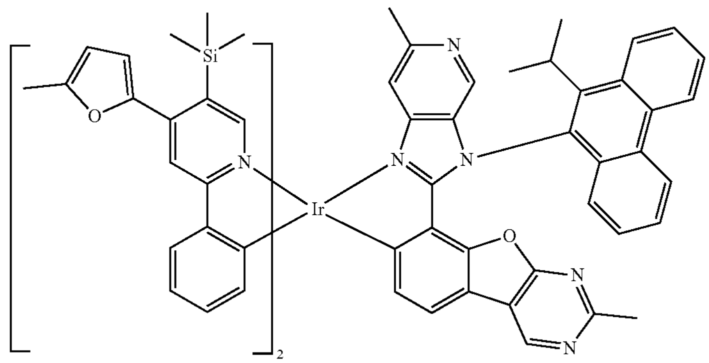

-continued
760
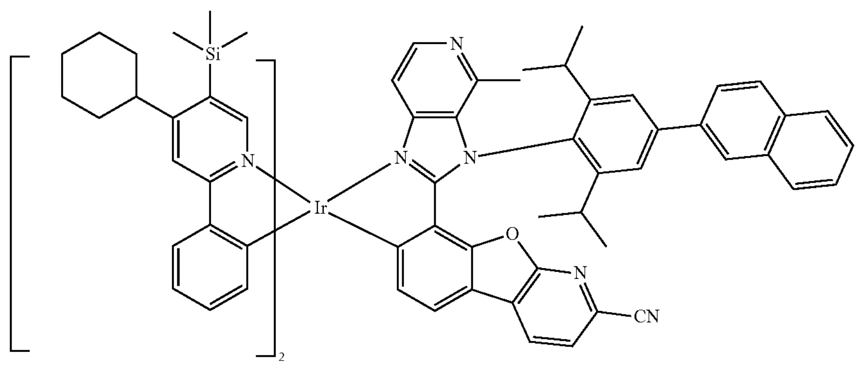
761
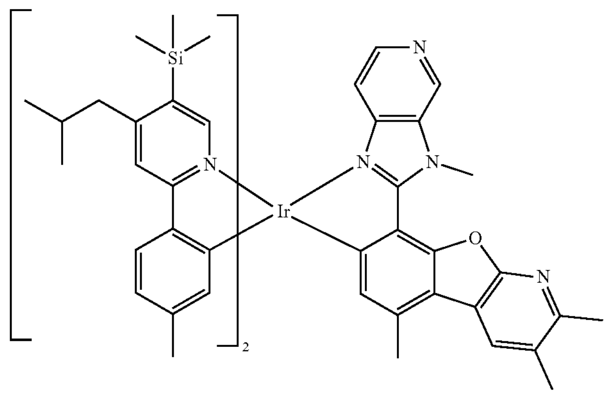
762
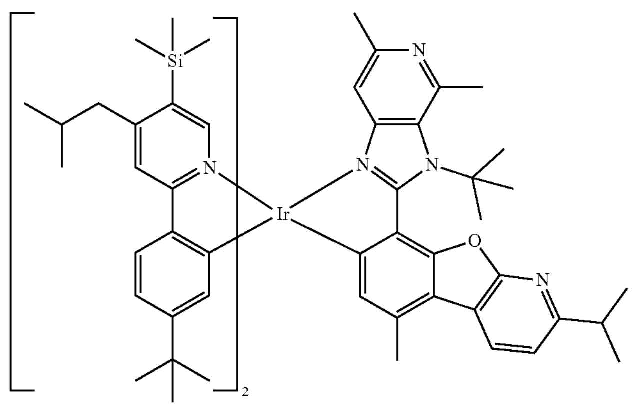

-continued
763
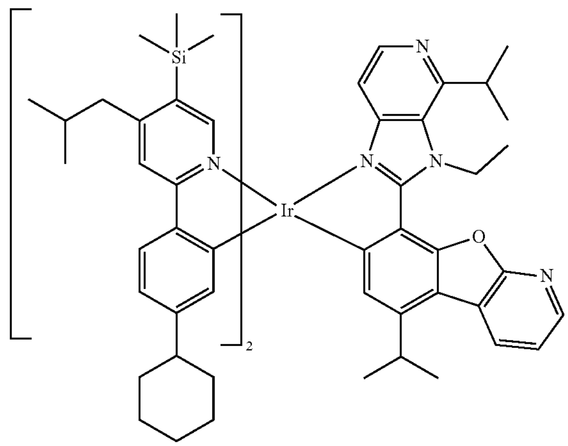
764
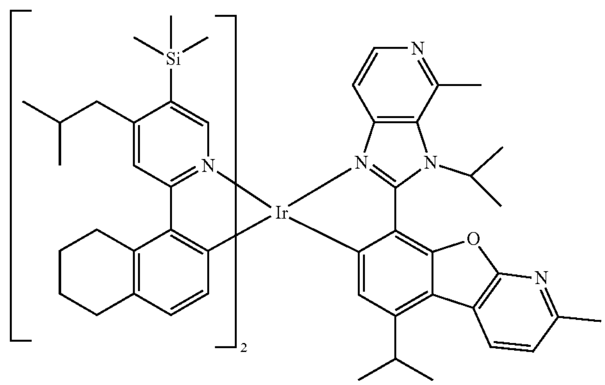
765
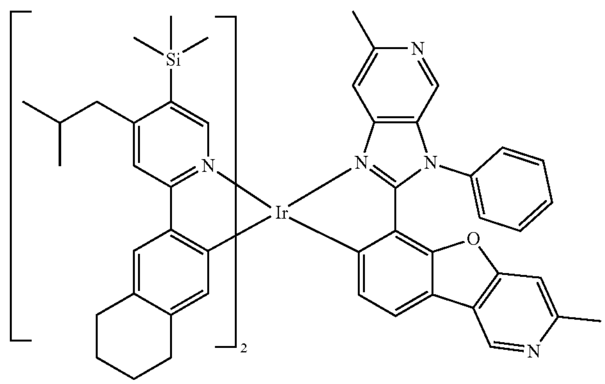

-continued
766
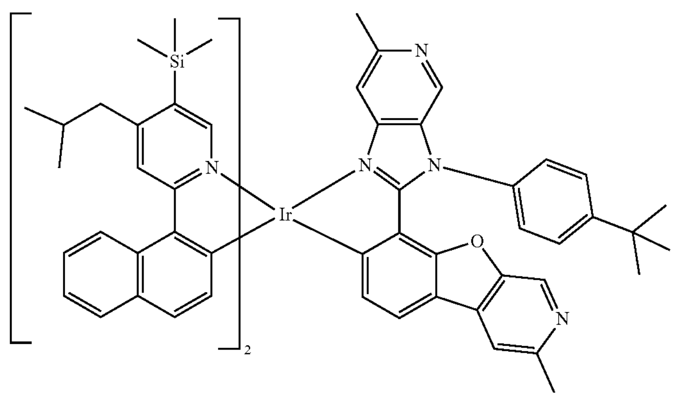
767
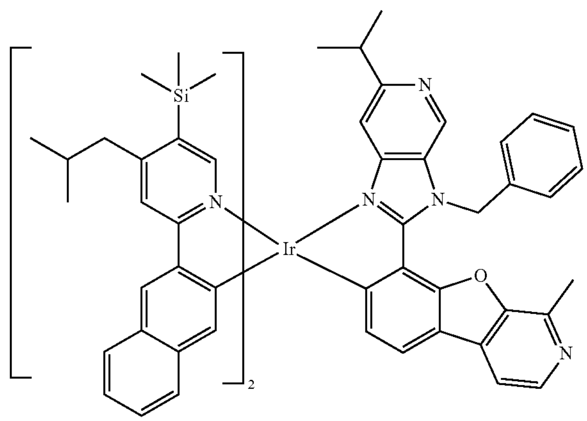
768
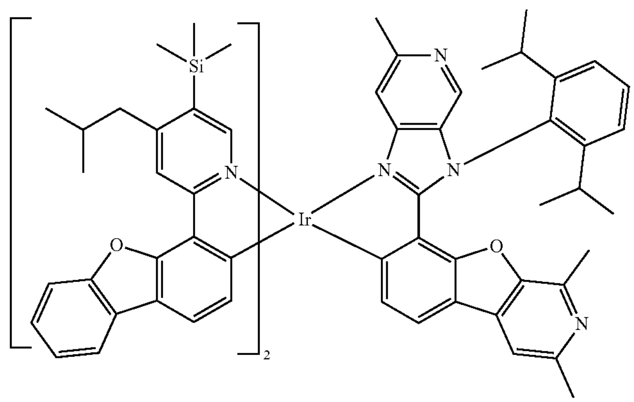

-continued
769
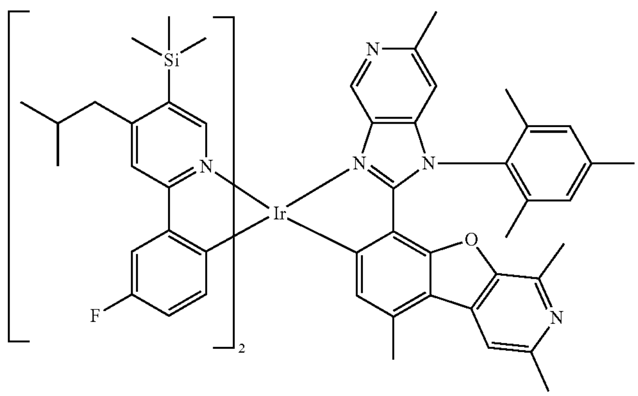
770
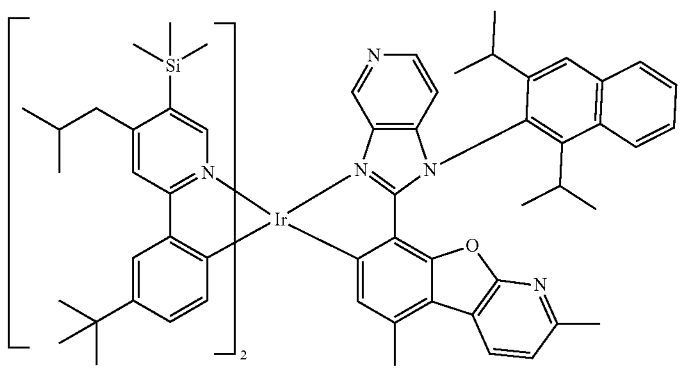
771
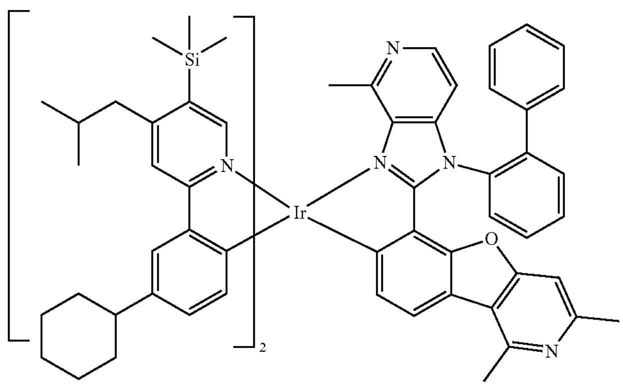
772
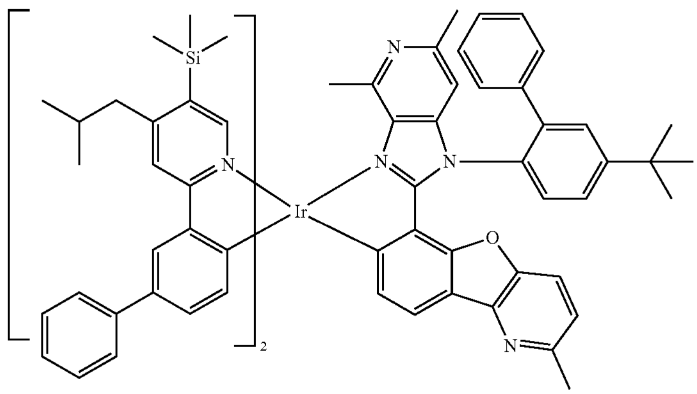

-continued
773
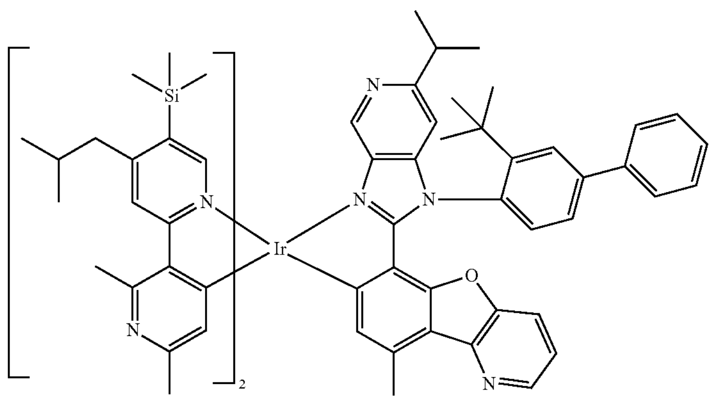
774
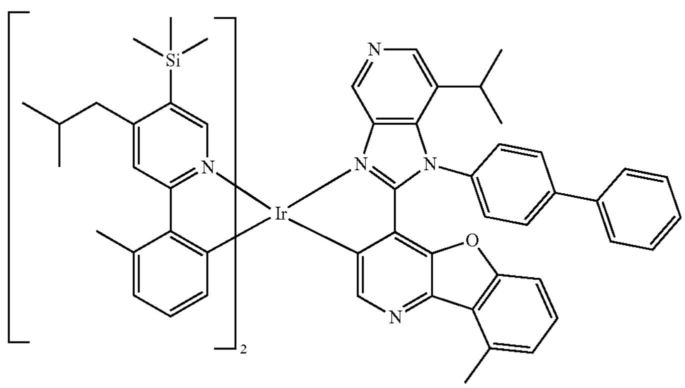
775
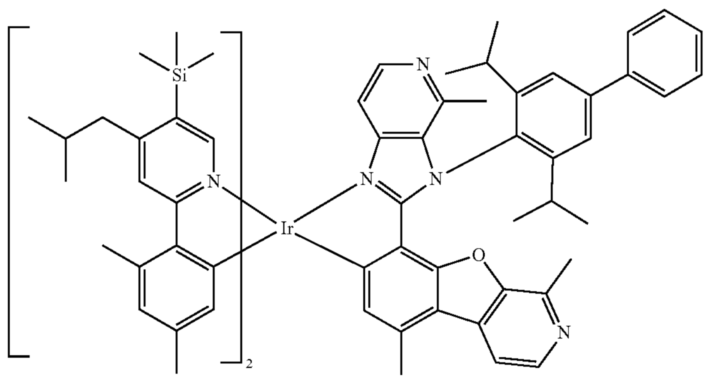
776
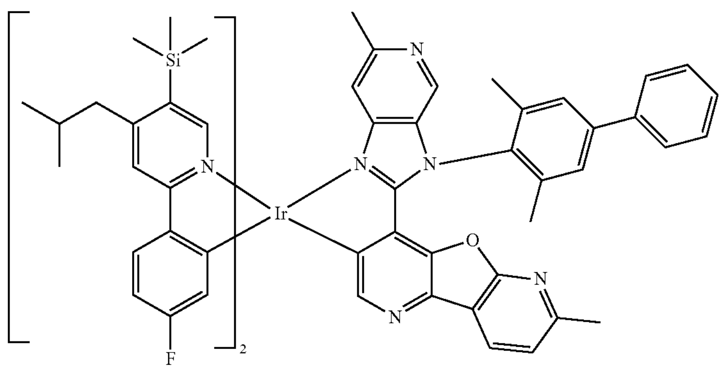

-continued
777
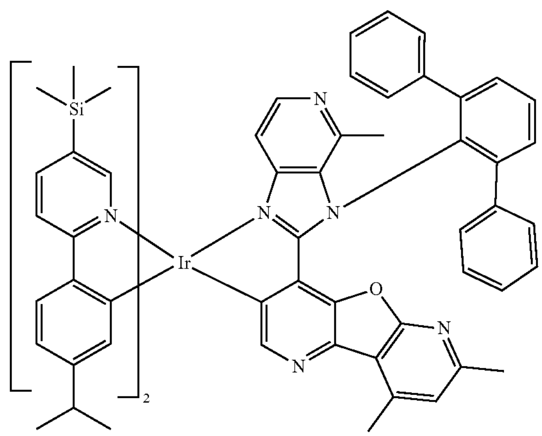
778
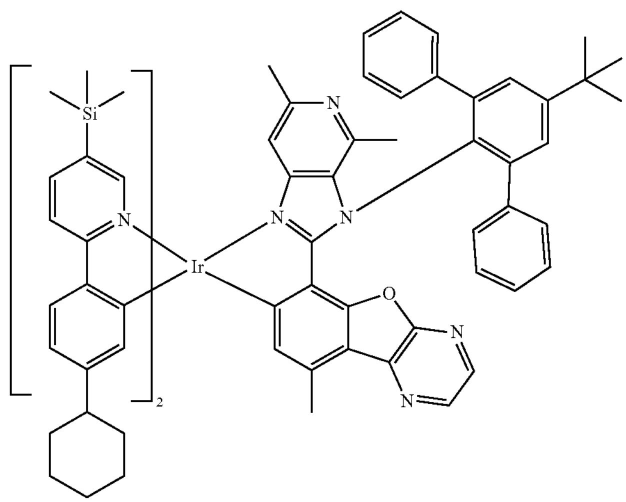
779
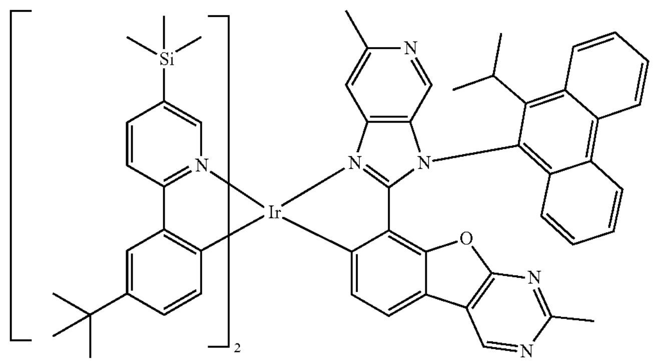

-continued
780
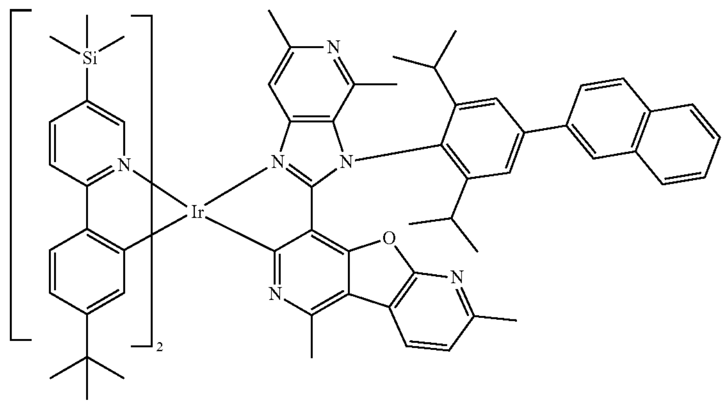
781
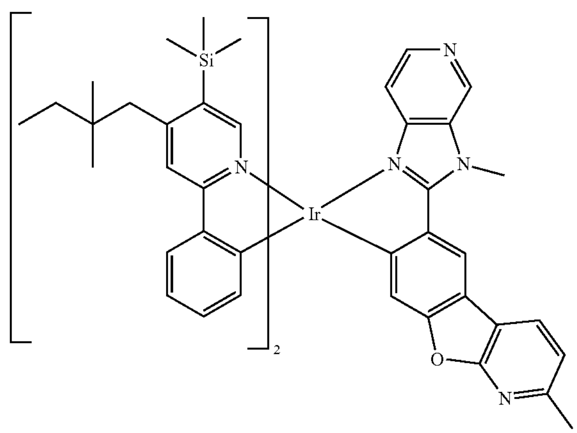
782
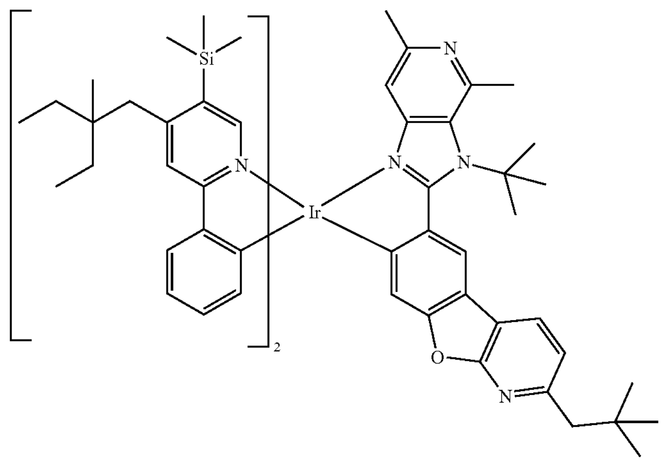

-continued
783
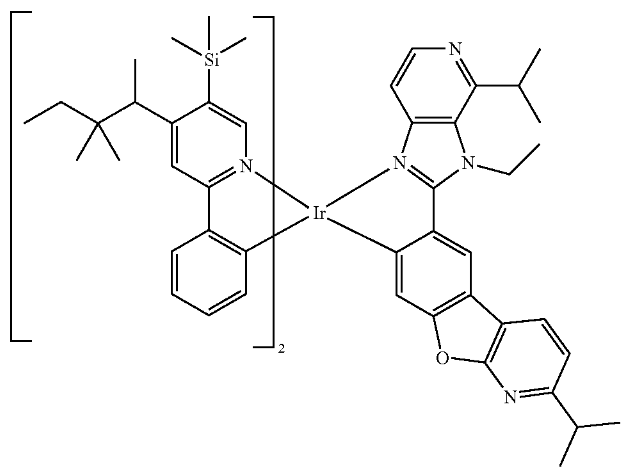
784
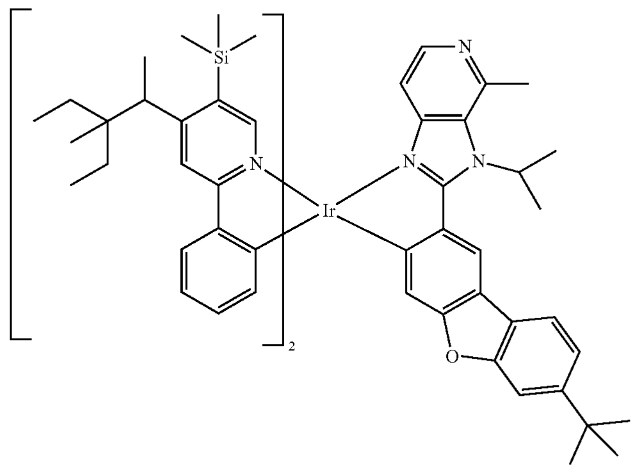
785
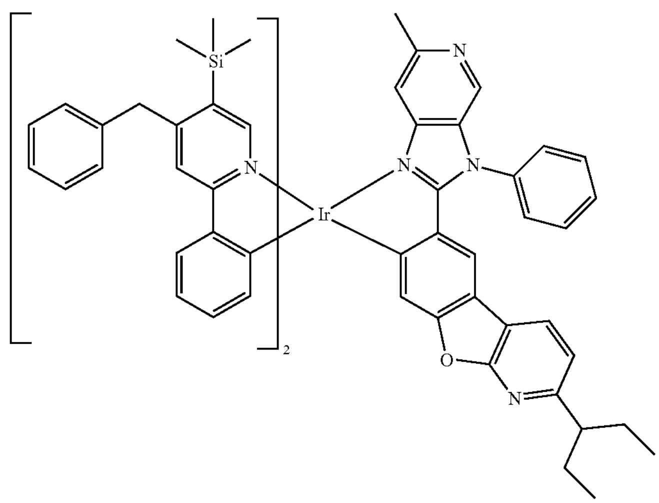

-continued
786
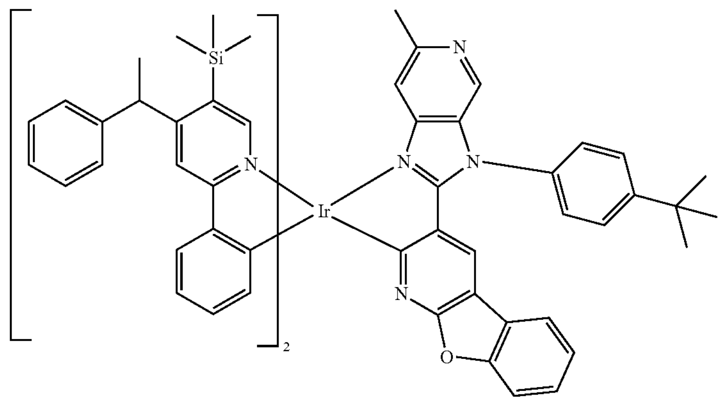
787
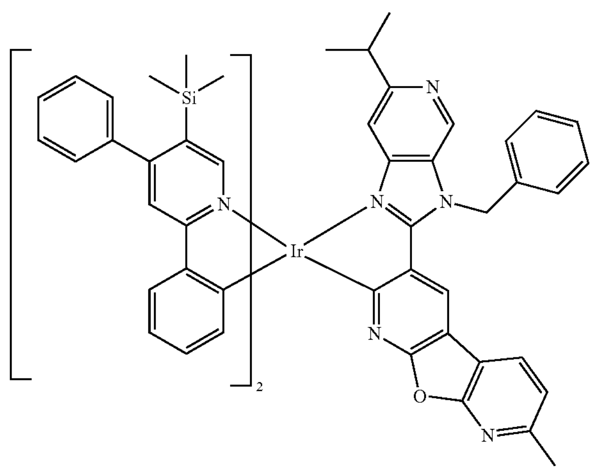
788
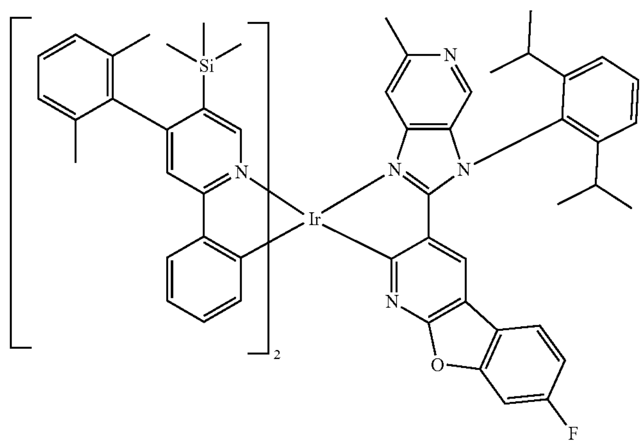

-continued
789
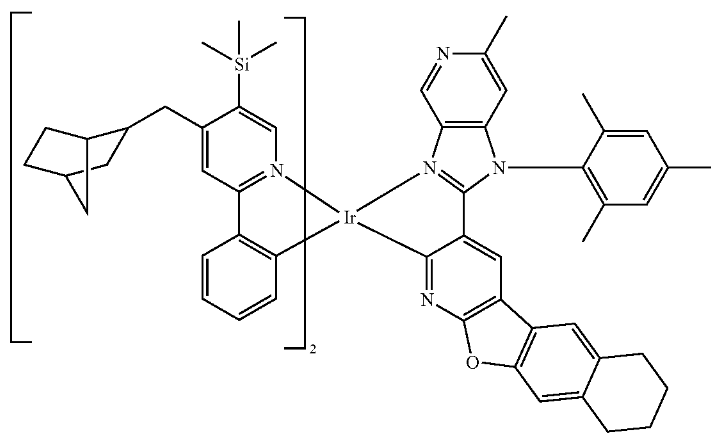
790
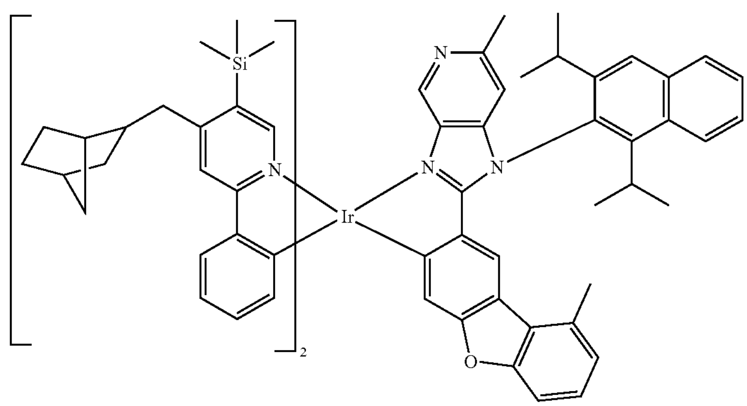
791
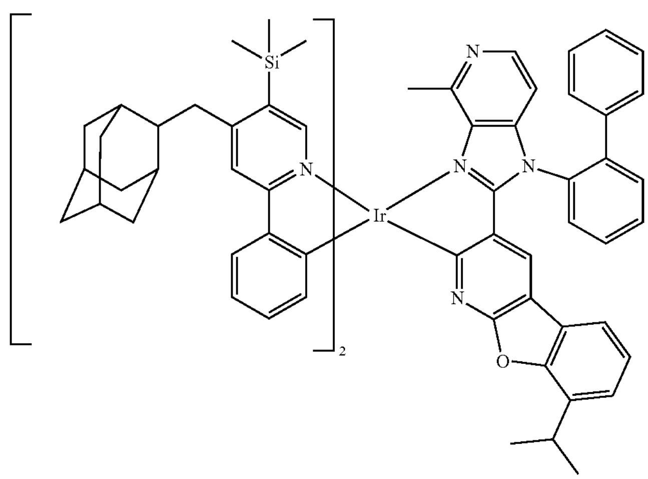

-continued
792
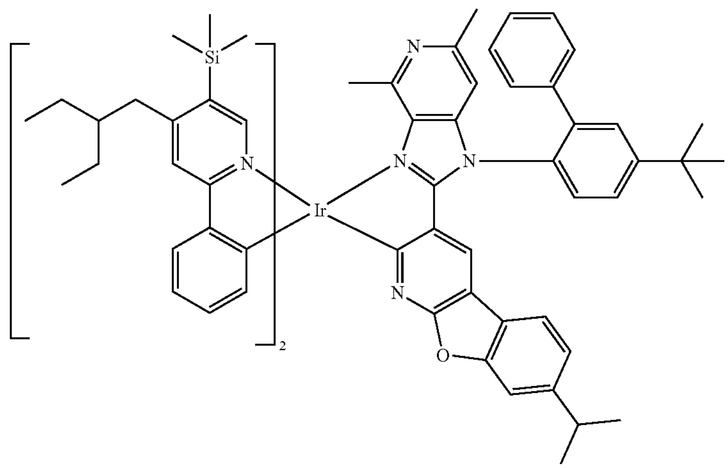
793
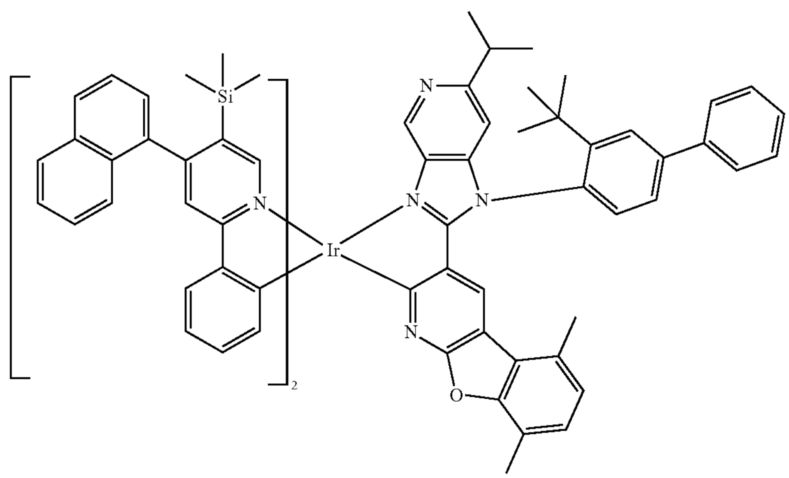
794
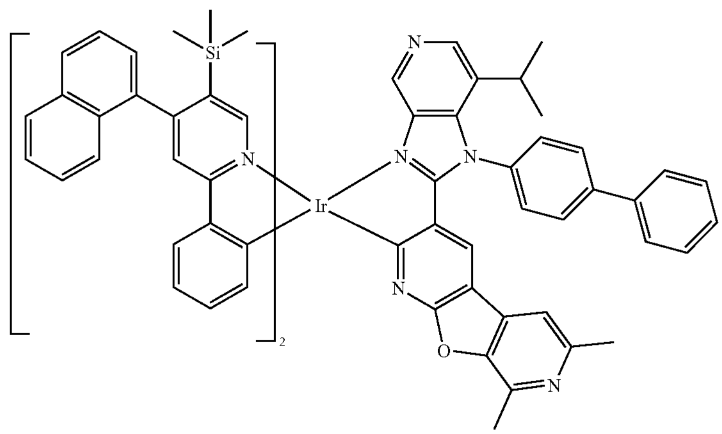

-continued
795
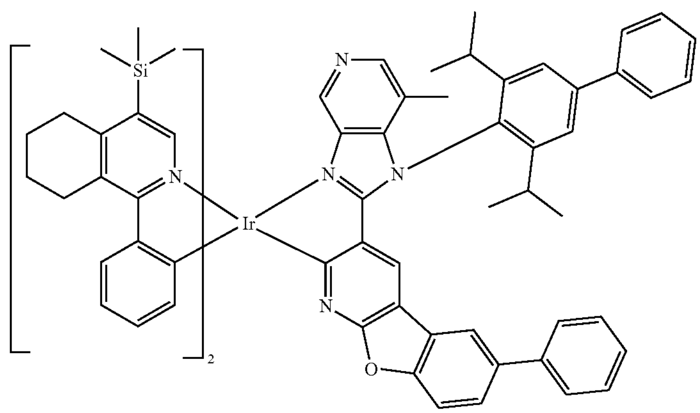
796
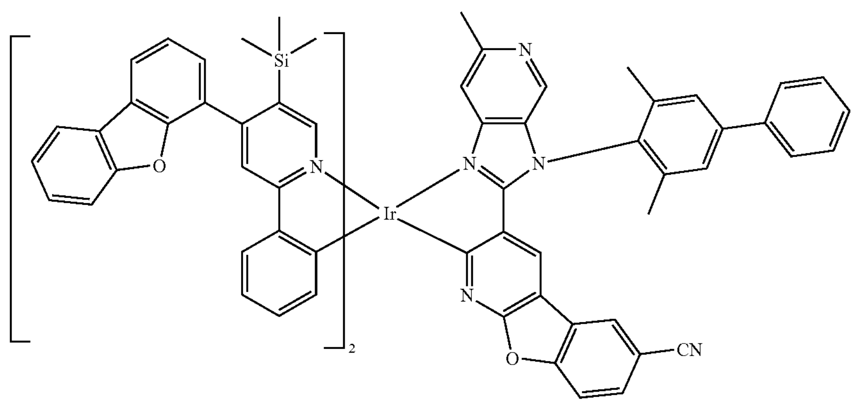
797
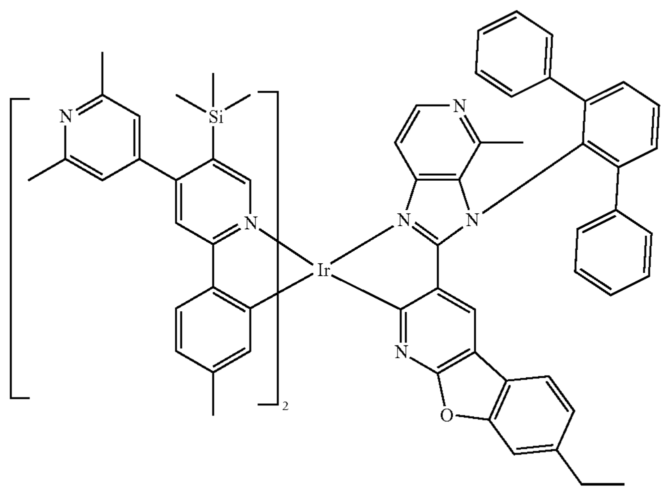

-continued
798
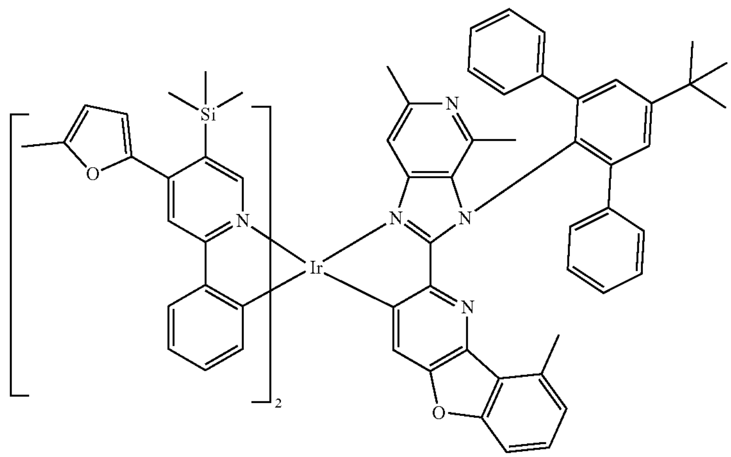
799
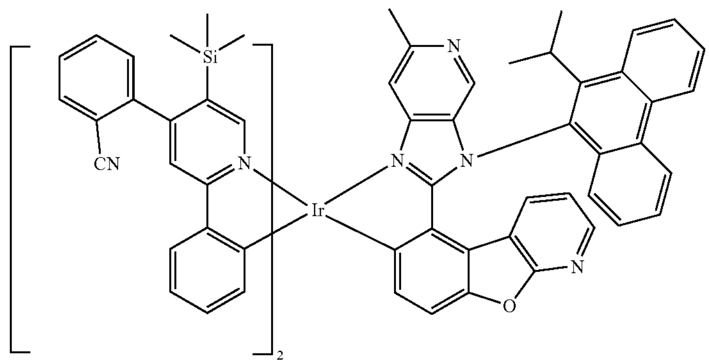
800
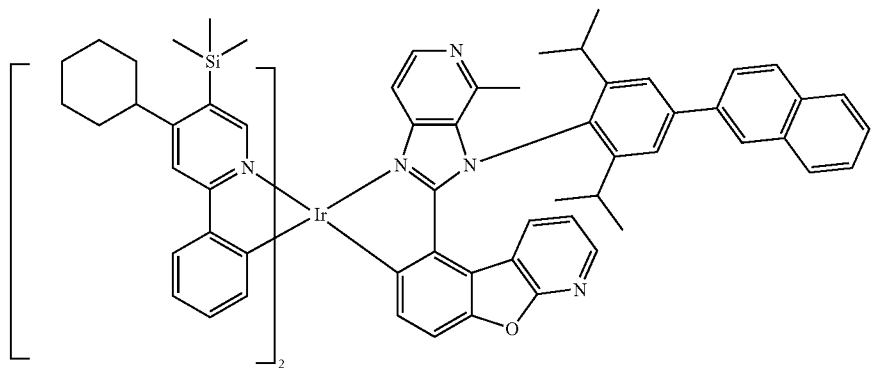

-continued
801
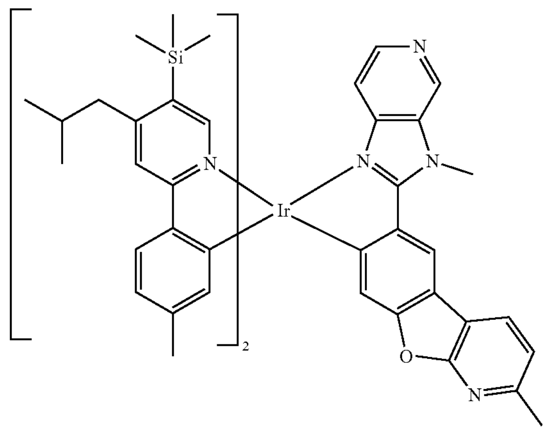
802
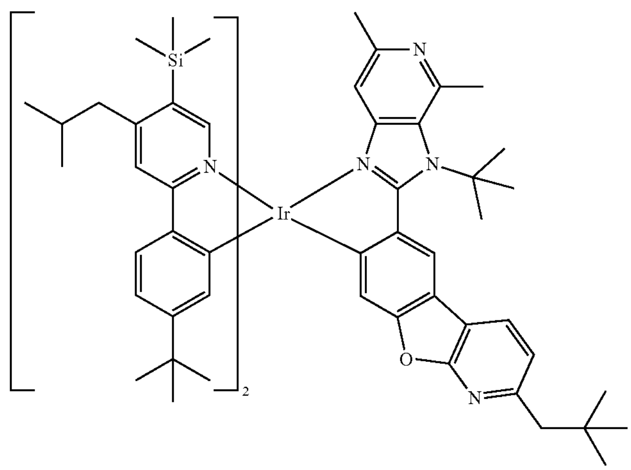
803
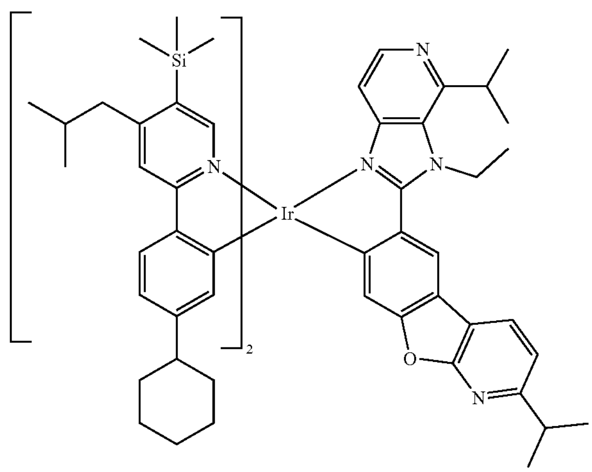

-continued
804
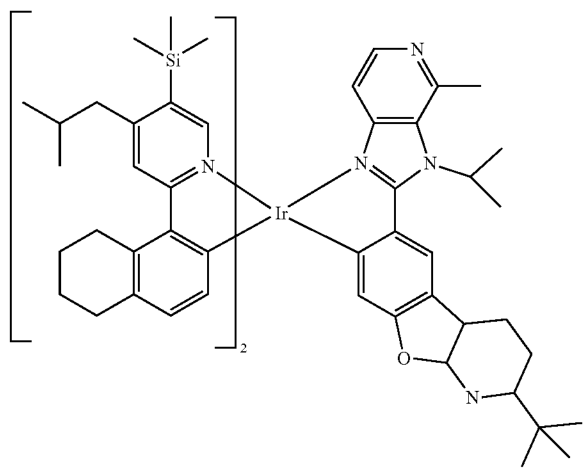
805
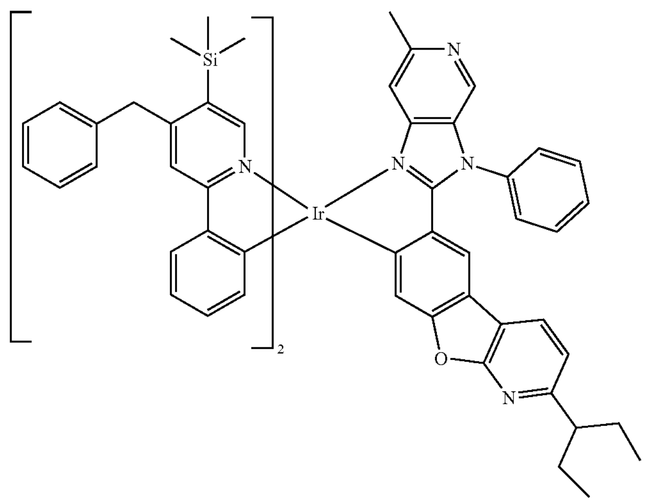
806
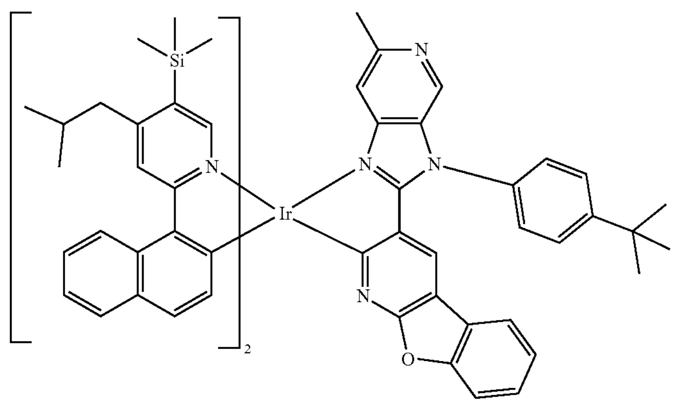

-continued
807
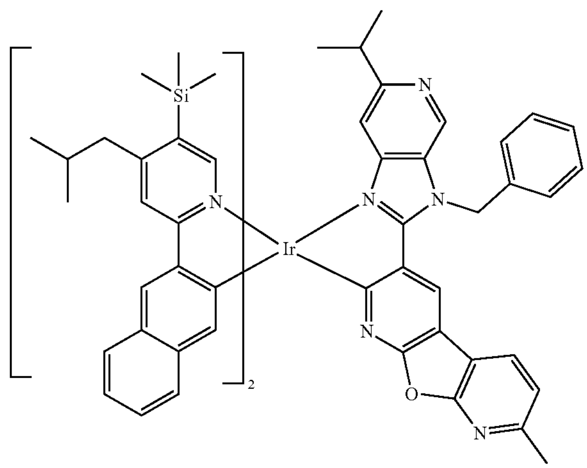
808
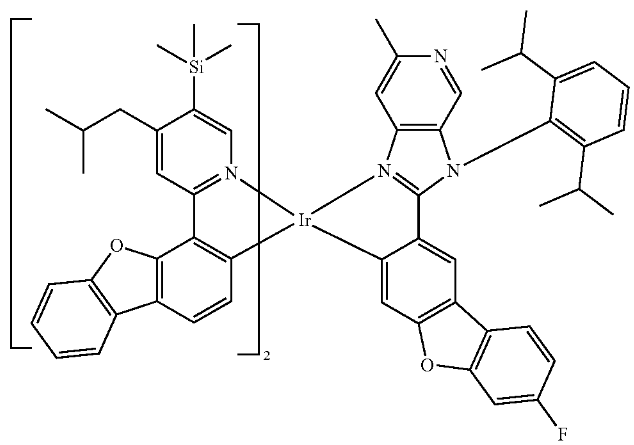
809
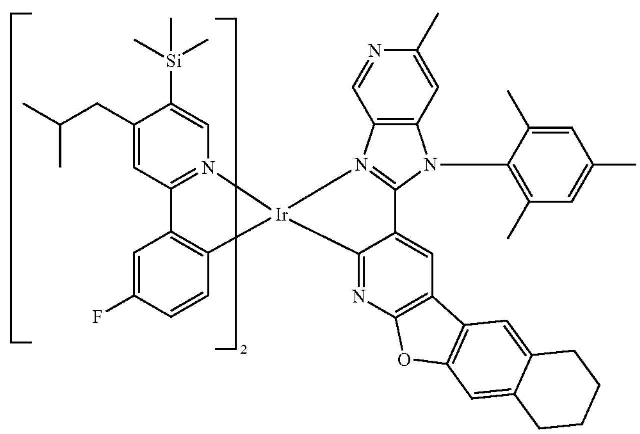

-continued
810
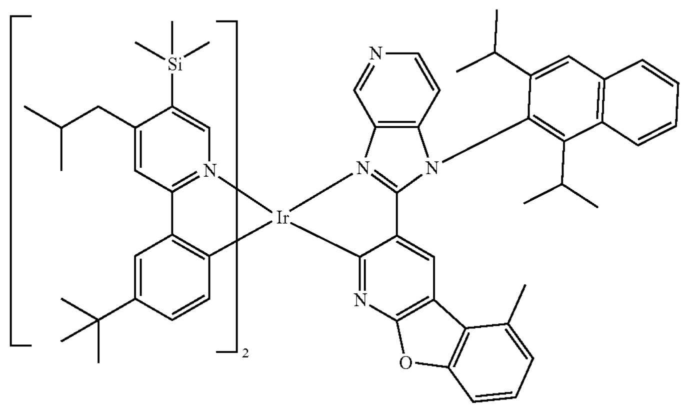
811
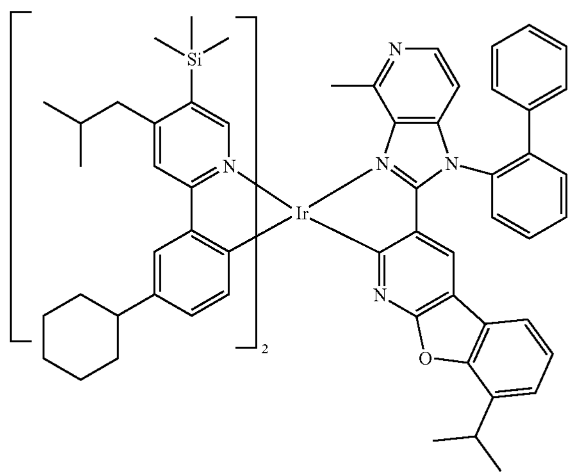
812
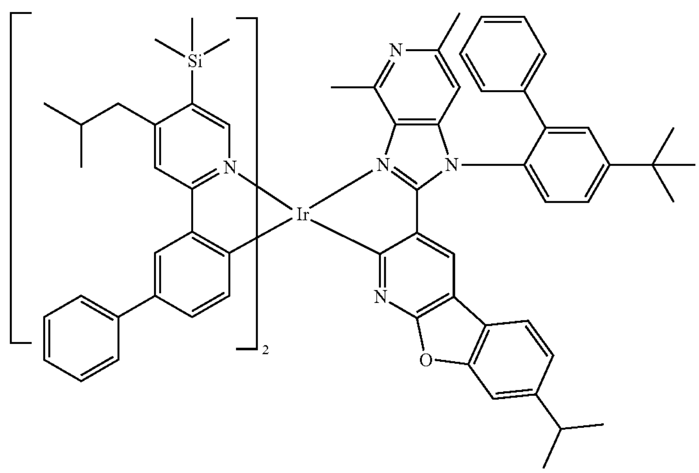

-continued
813
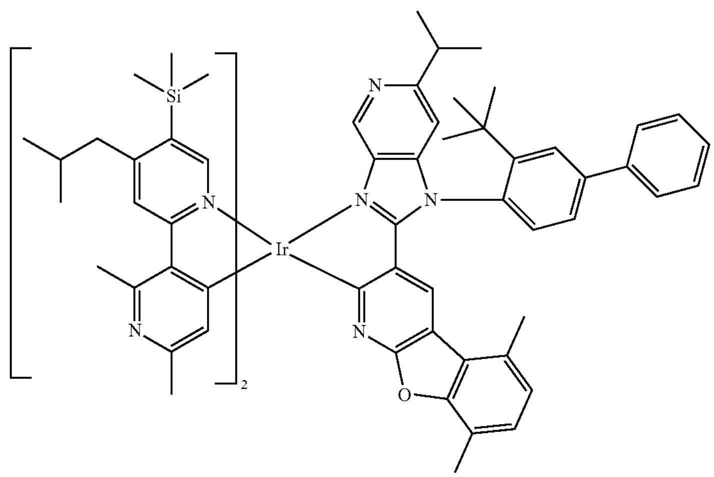
814
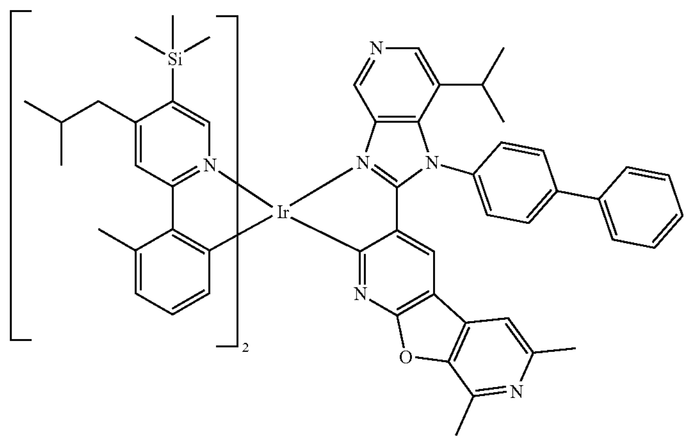
815
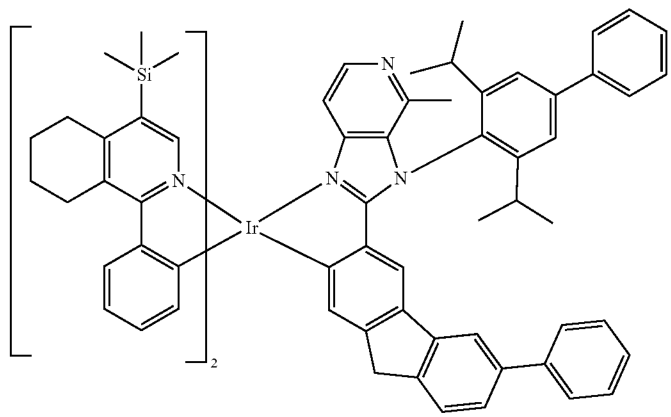

-continued
816
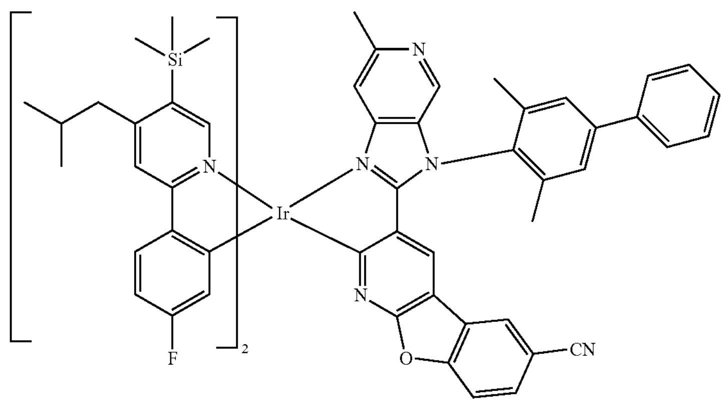
817
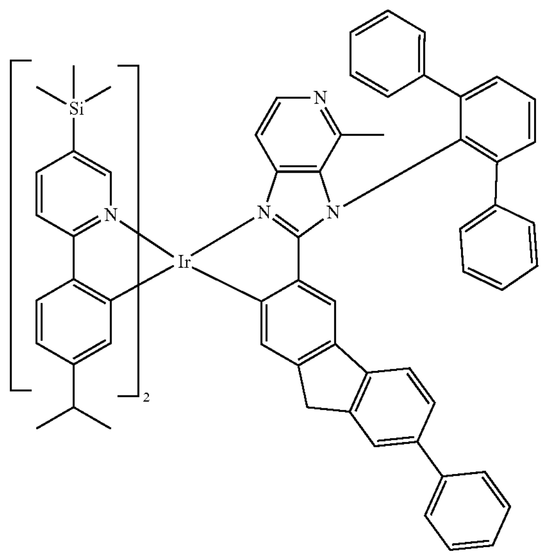
818
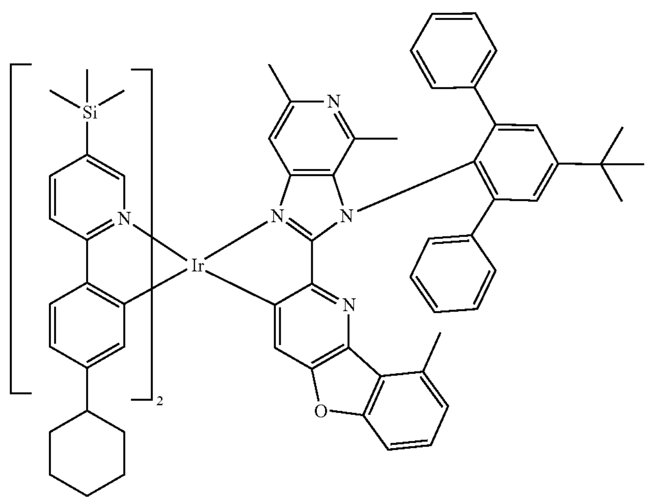

-continued
819
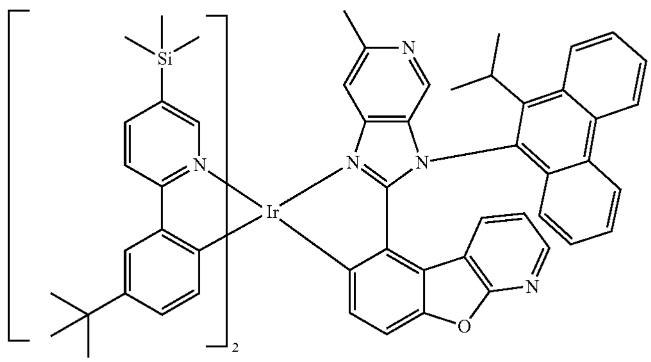
820
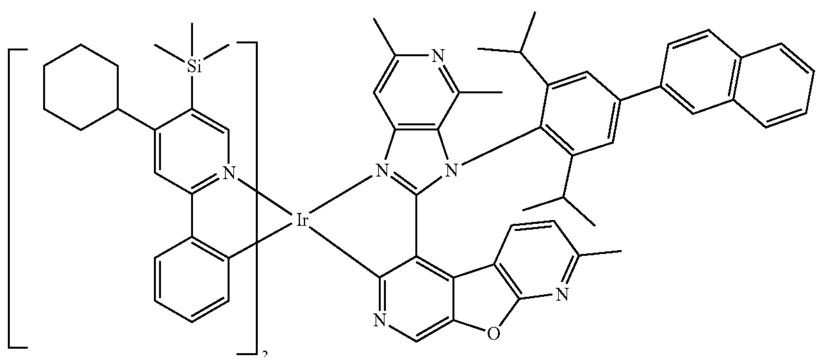
821
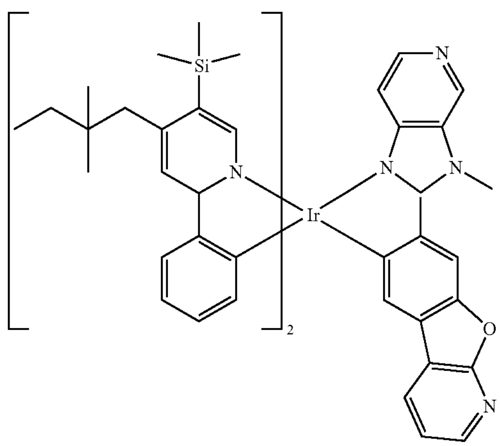
822
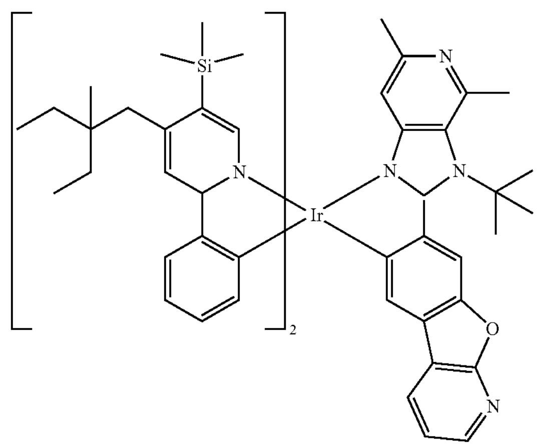

-continued
823
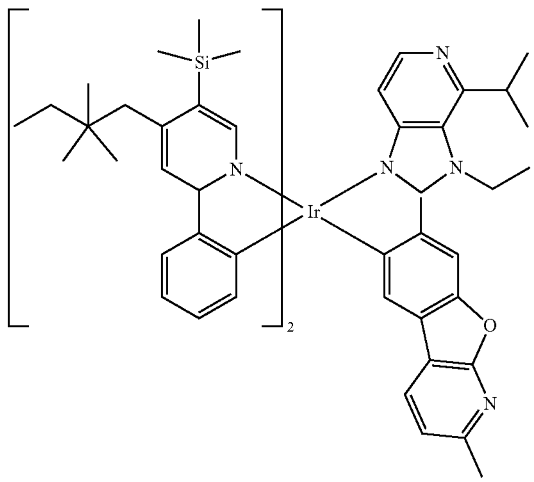
824
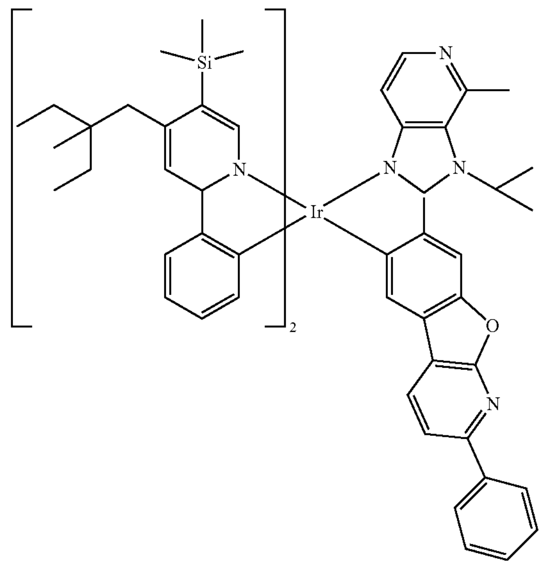
825
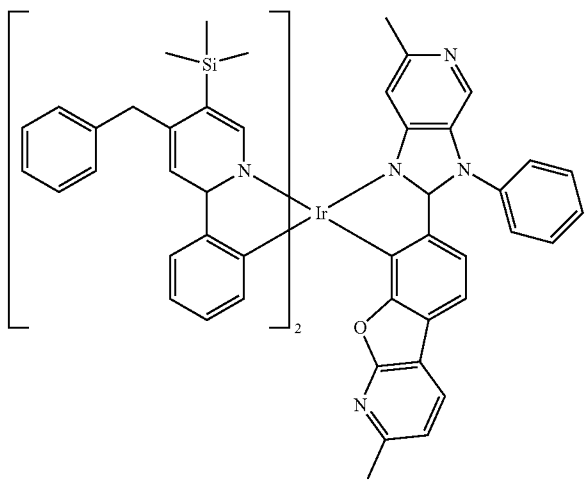
826
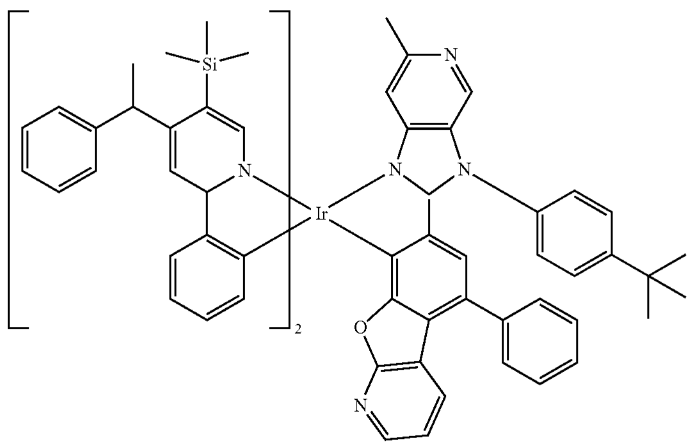

-continued
827
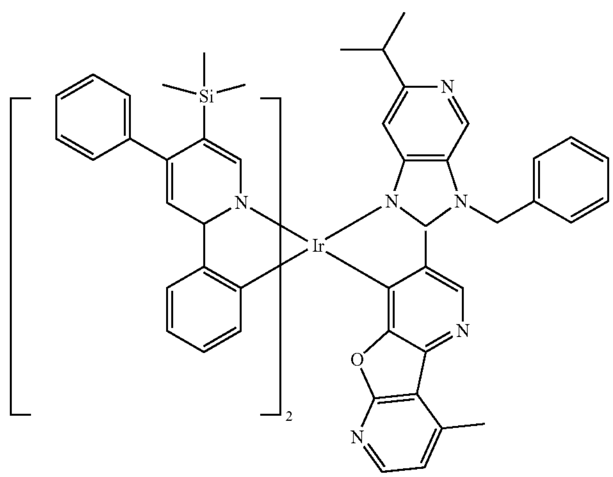
829
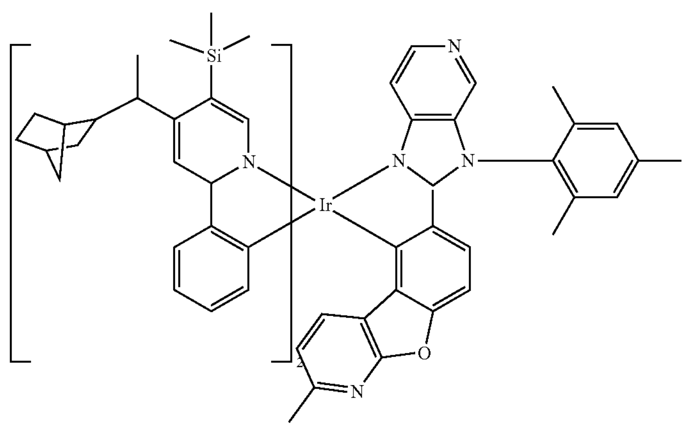
830
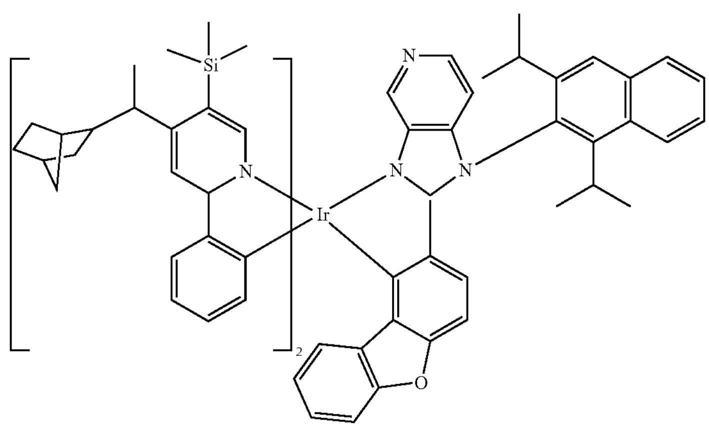

-continued
831
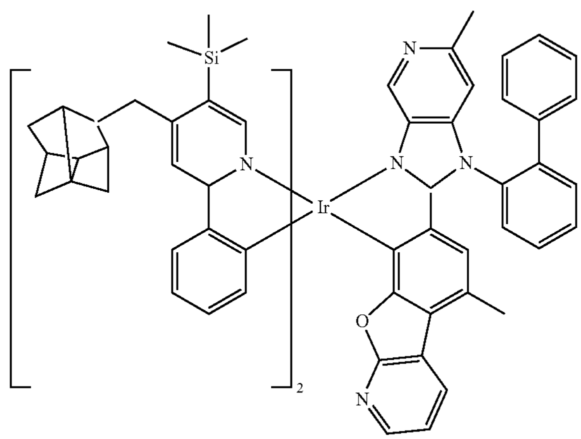
832
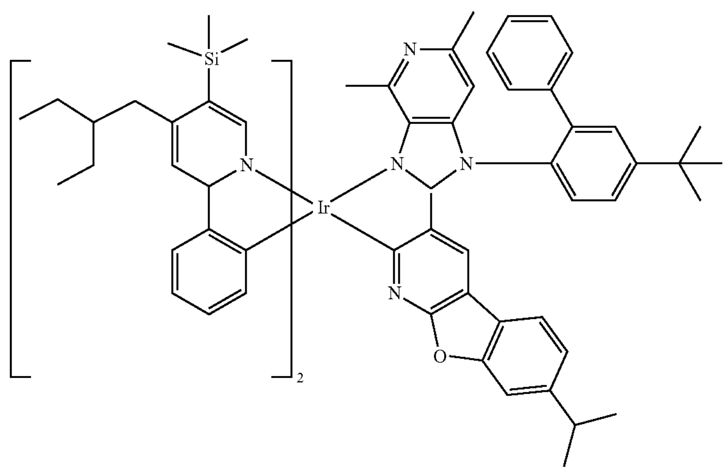
833
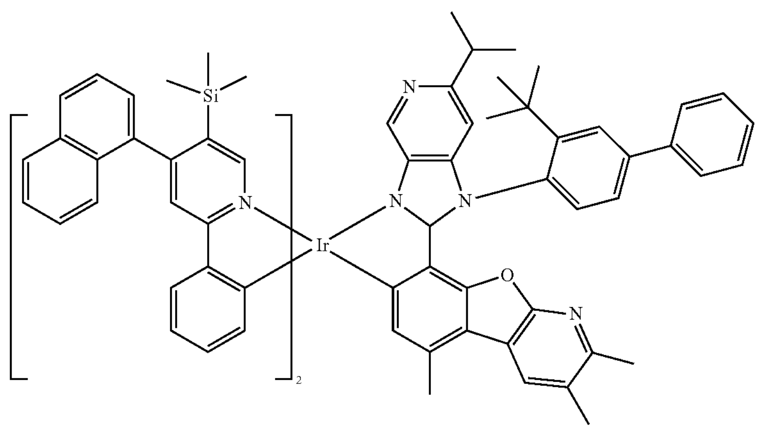

-continued
834
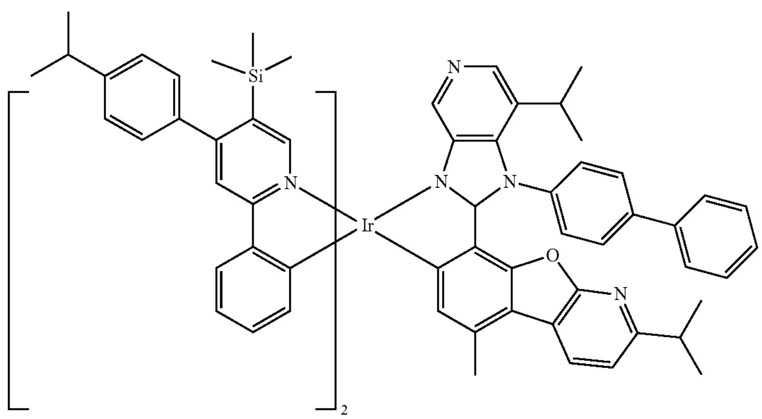
835
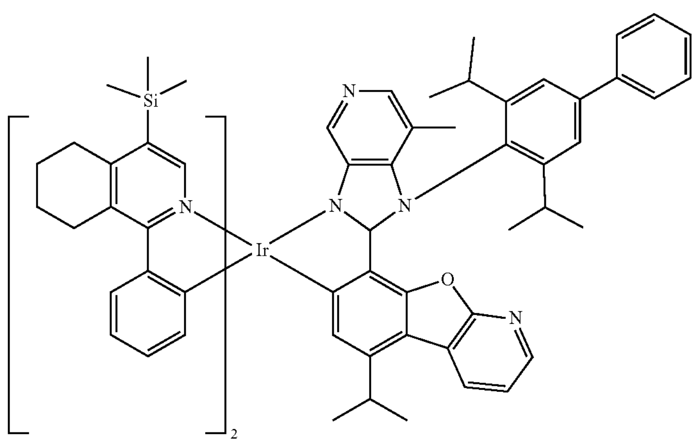
836
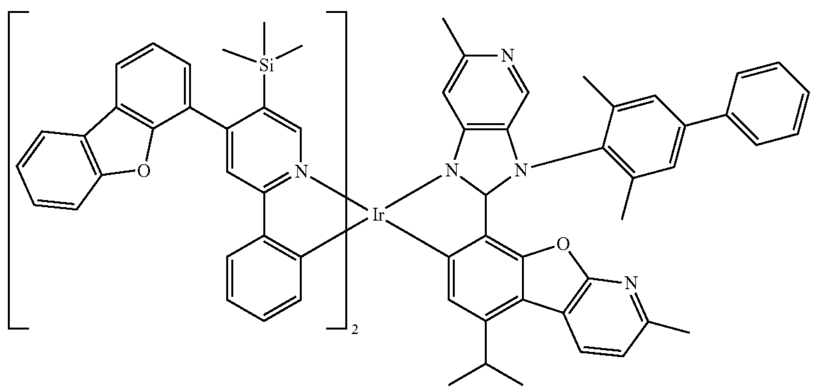
837
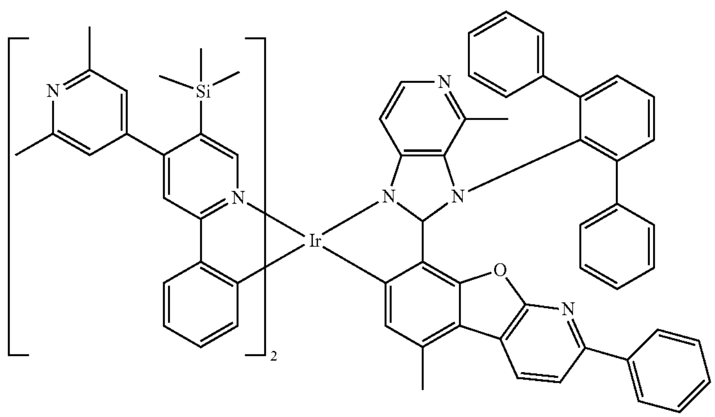

-continued
838
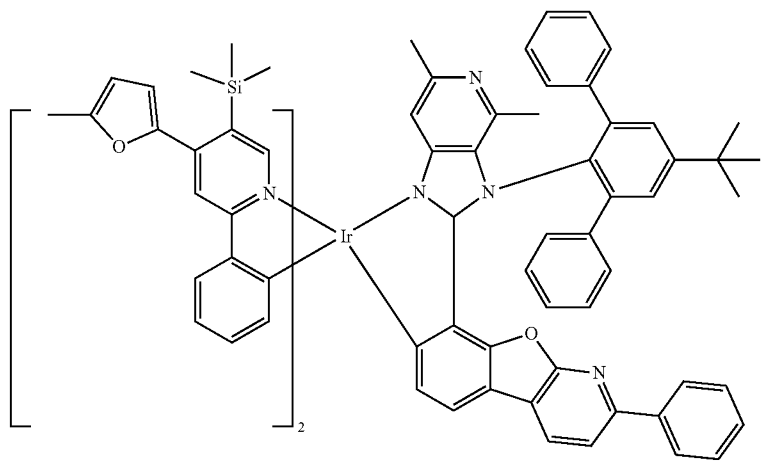
839
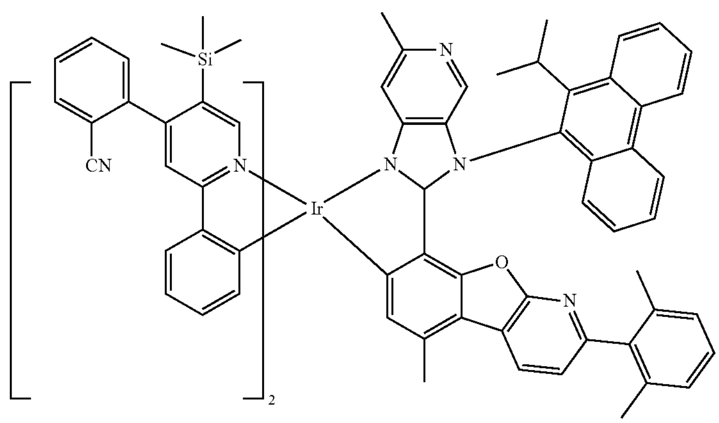
840
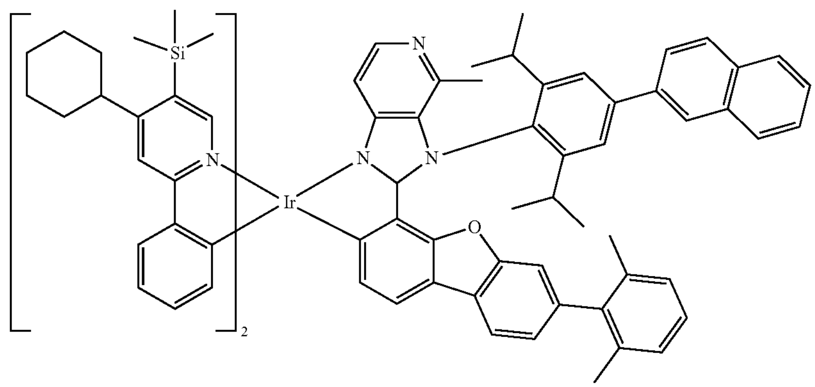
841
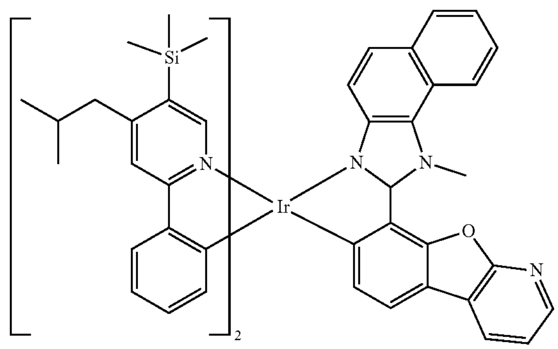

-continued
842
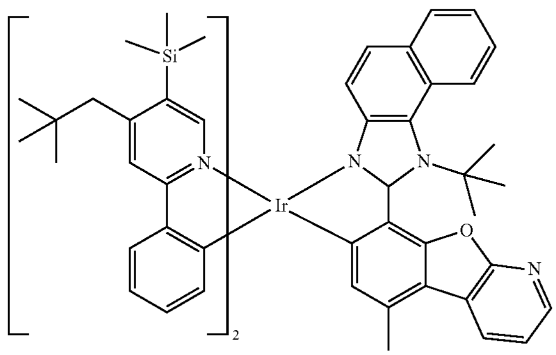
843
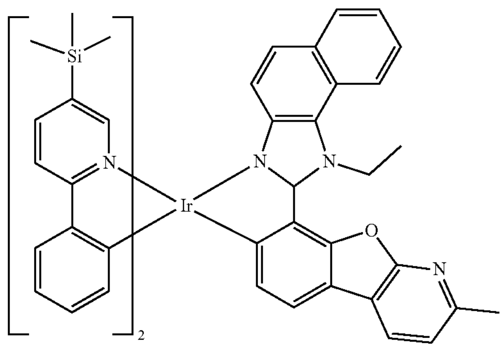
844
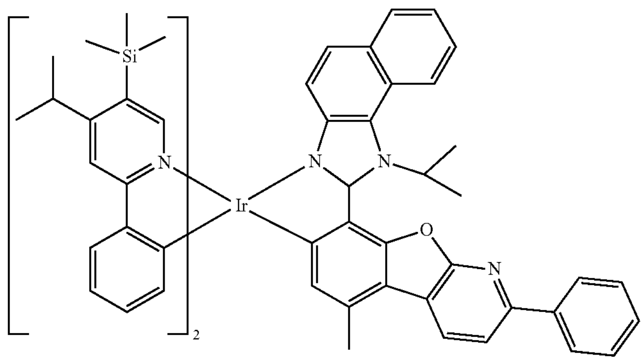
845
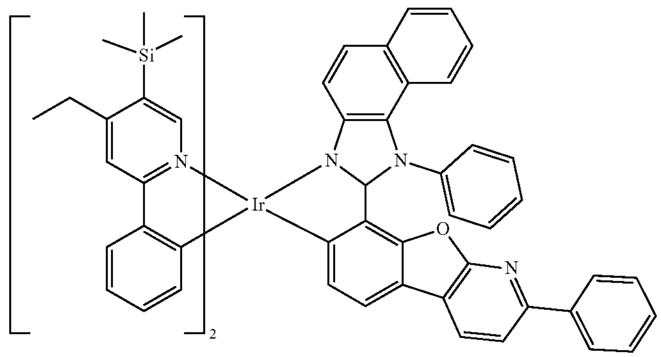

-continued
846
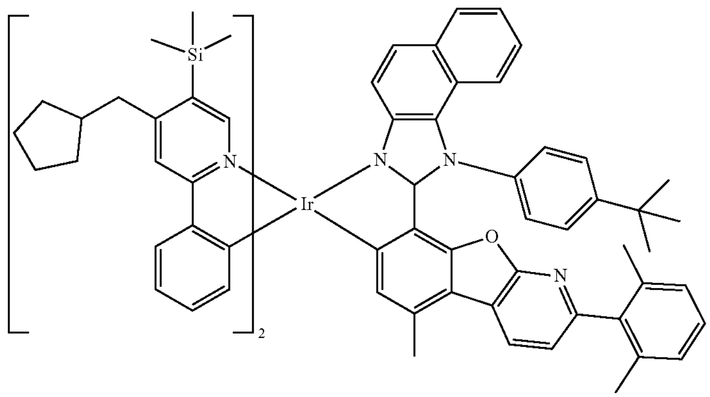
847
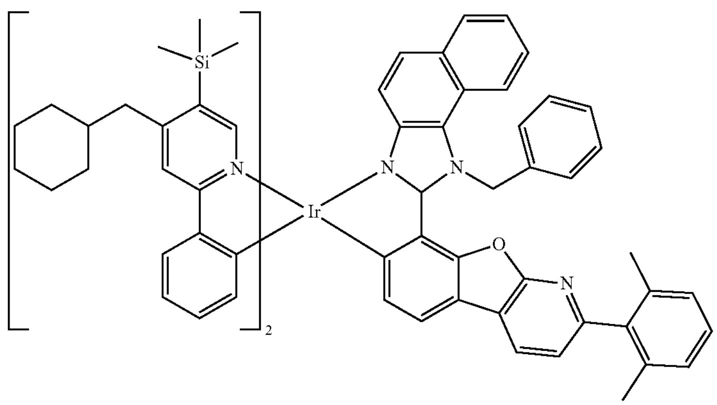
848
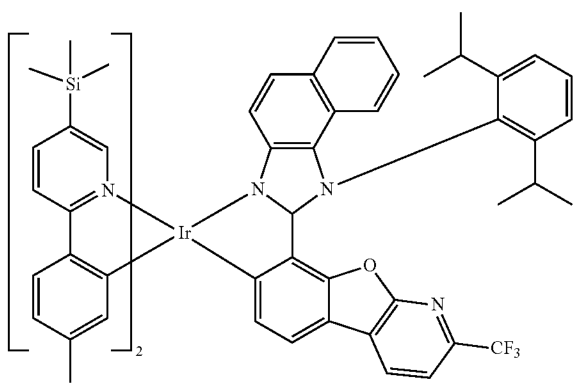
849
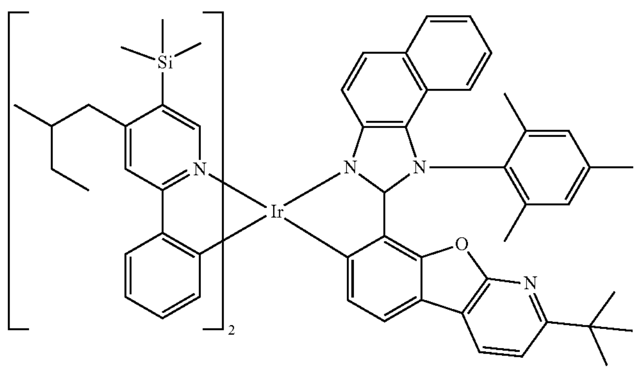

-continued
850
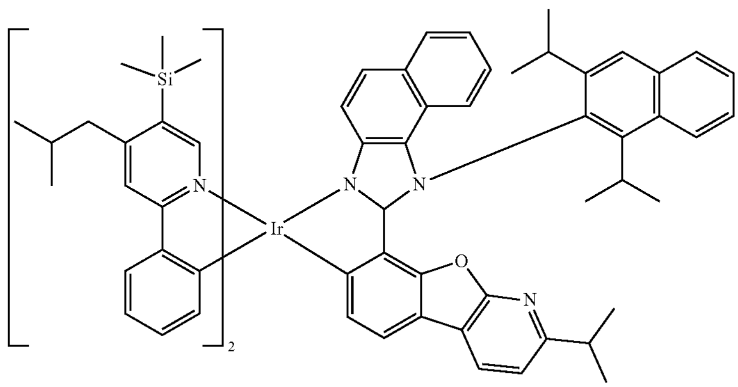
851
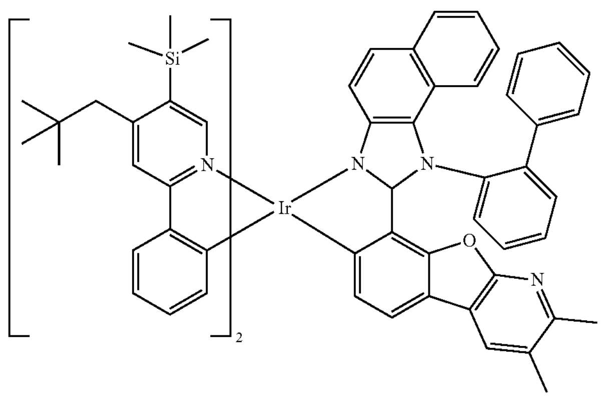
852
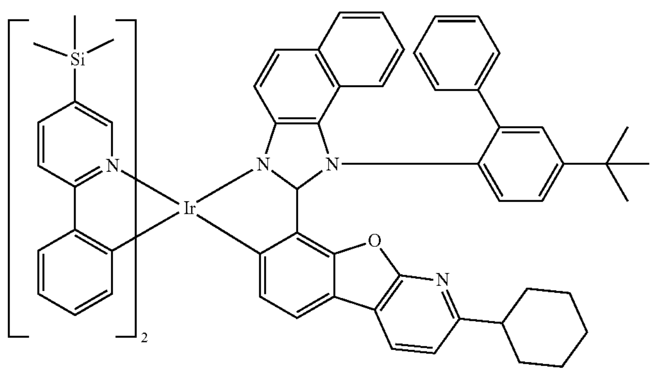
853
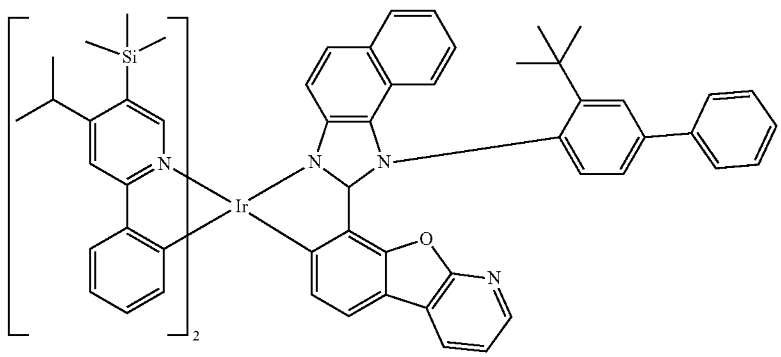

-continued
854
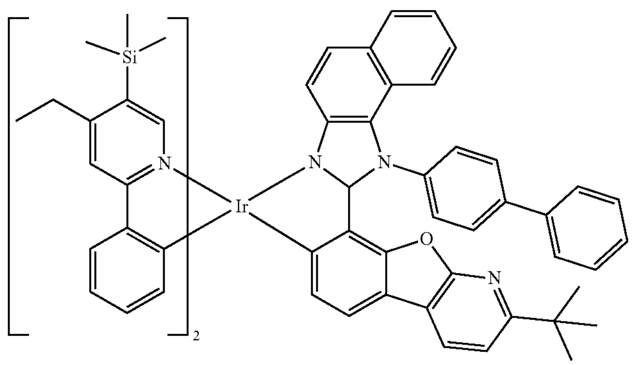
855
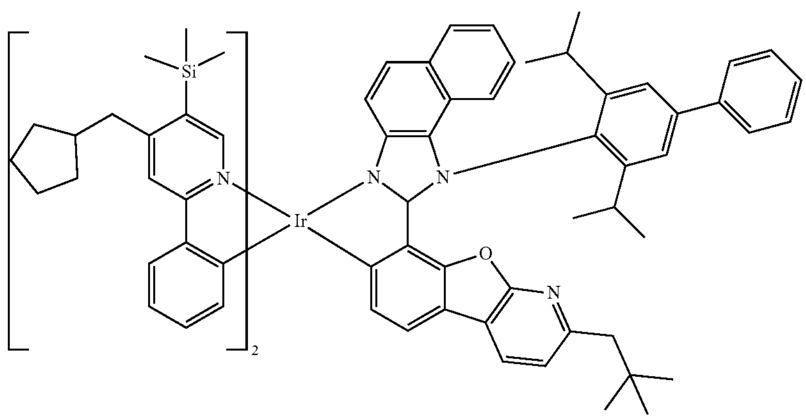
856
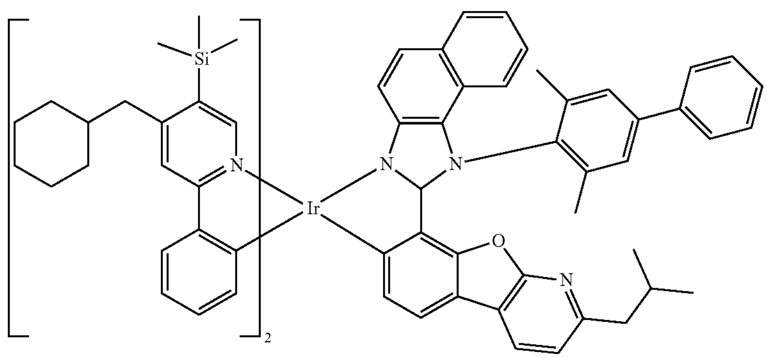
857
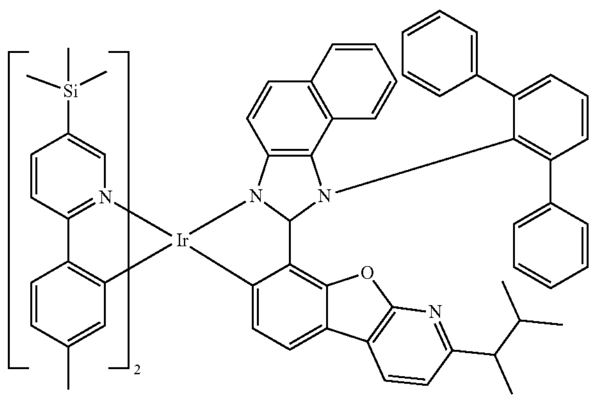

-continued
858
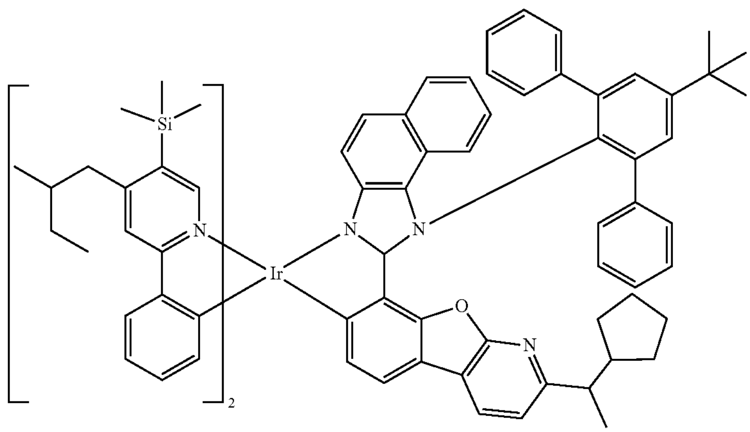
859
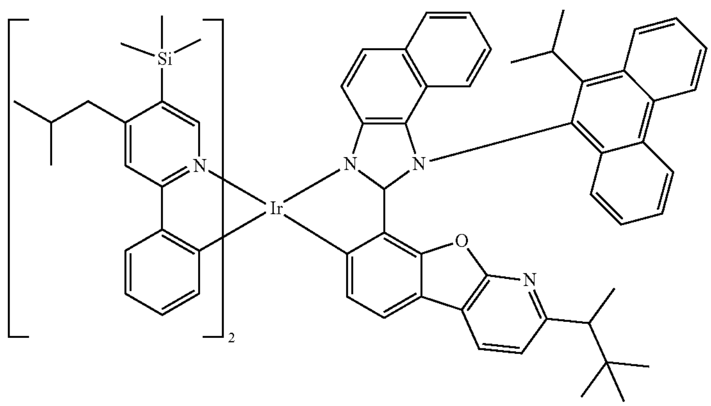
860
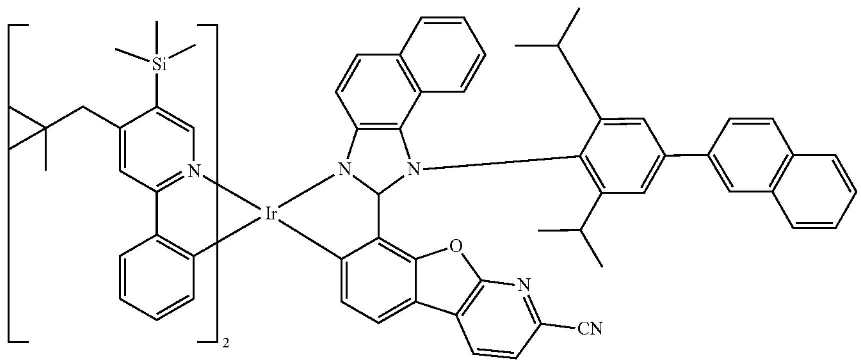
861
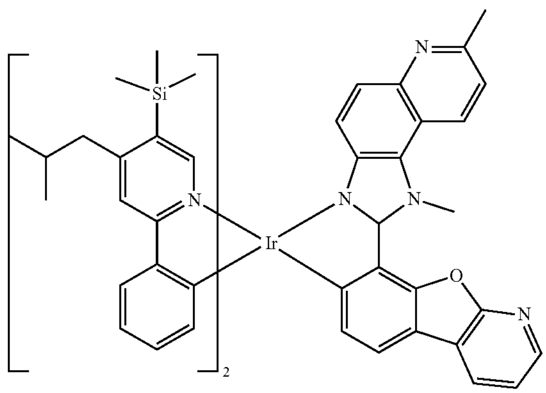

-continued
862
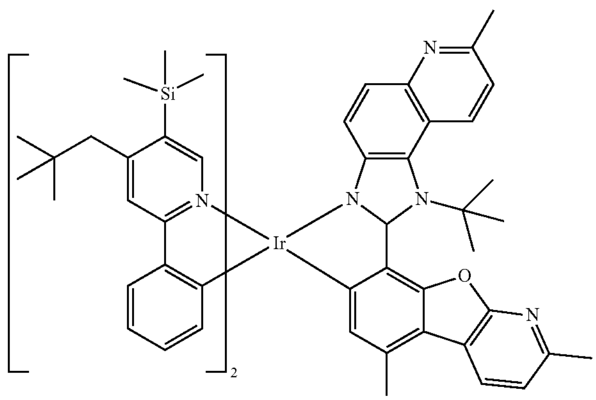
863
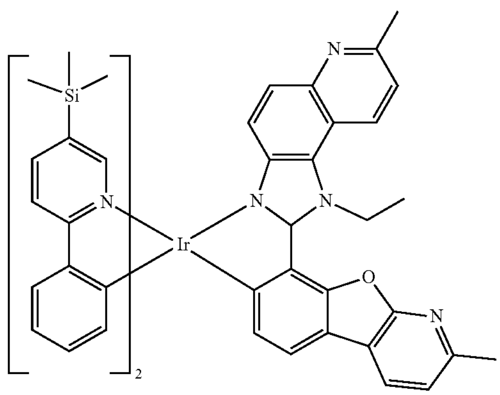
864
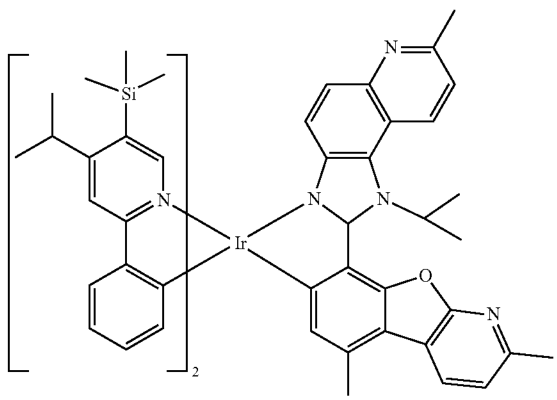
865
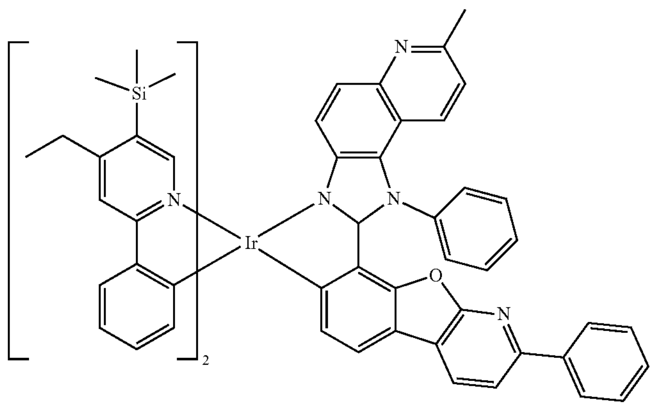

-continued
866
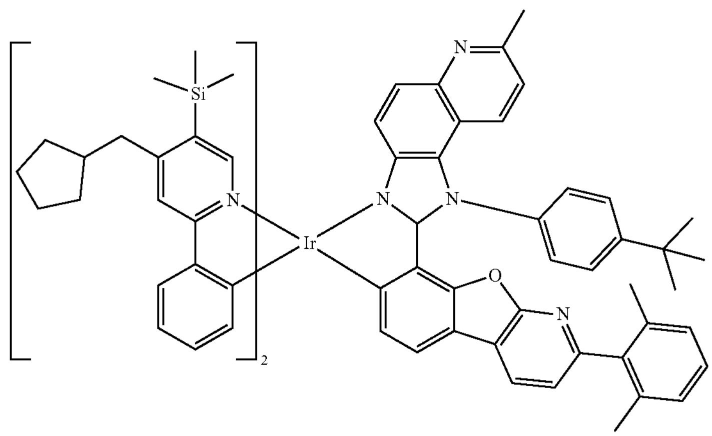
867
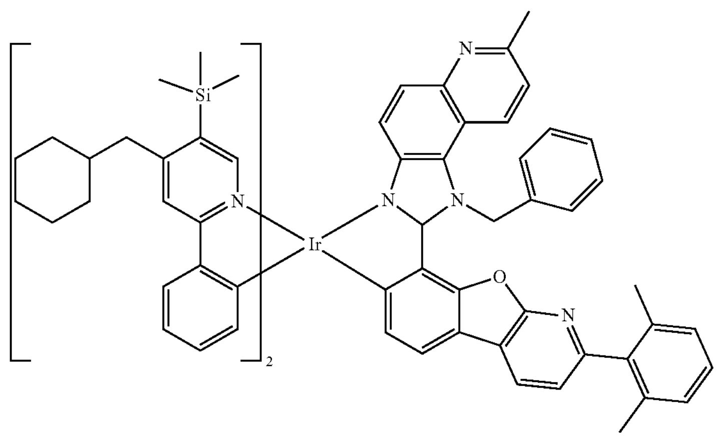
868
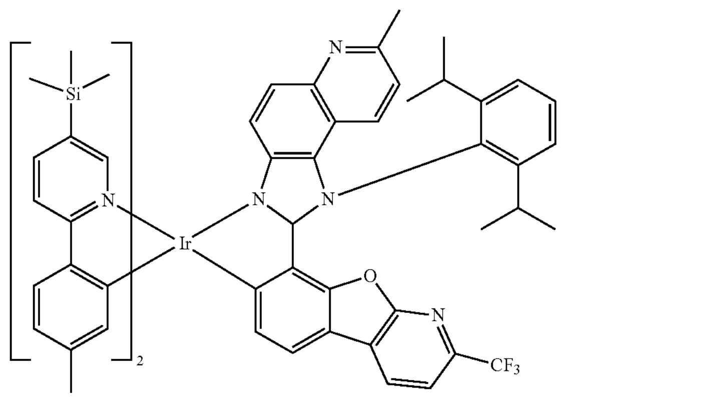
869
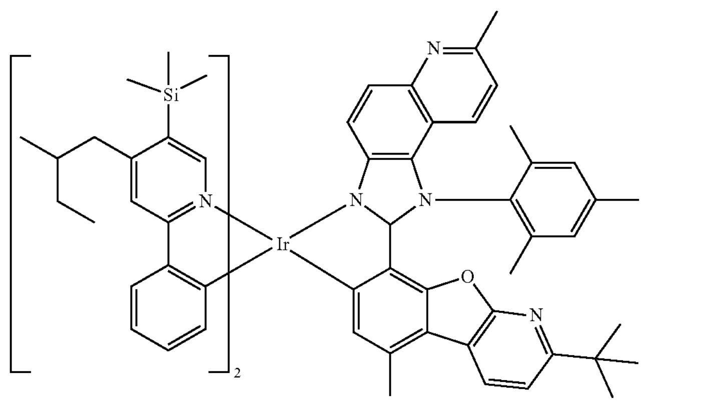

-continued
870
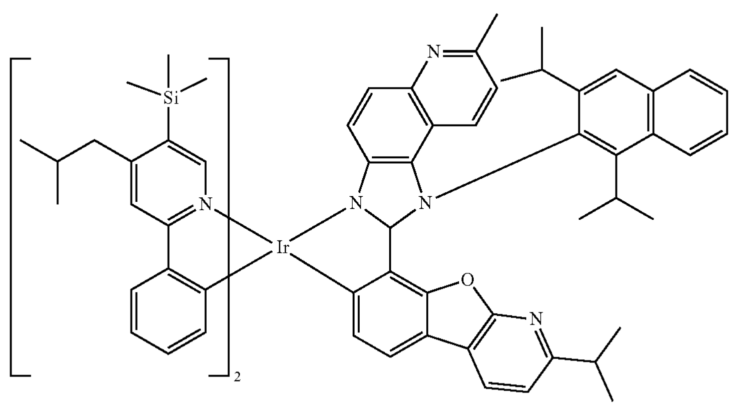
871
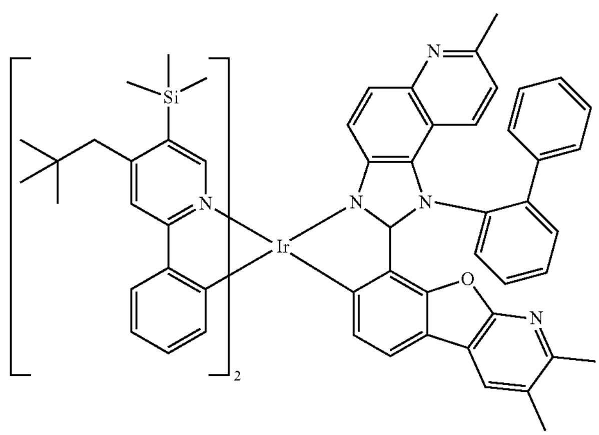
872
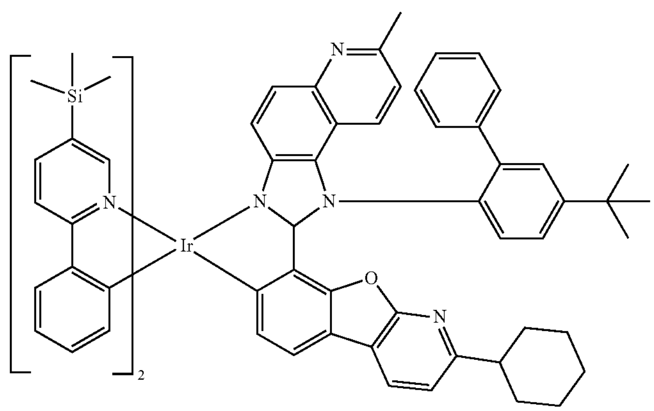
873
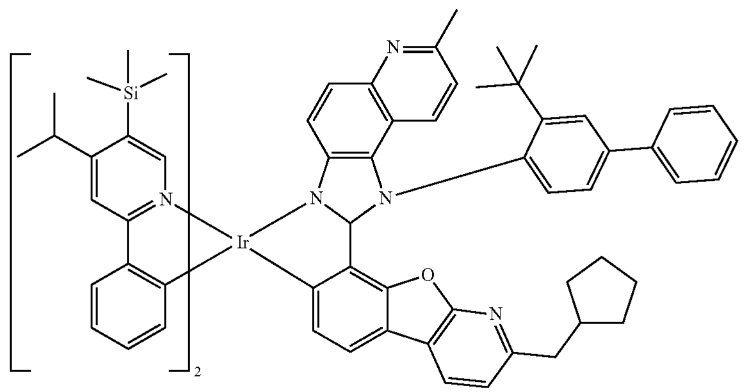

-continued
874
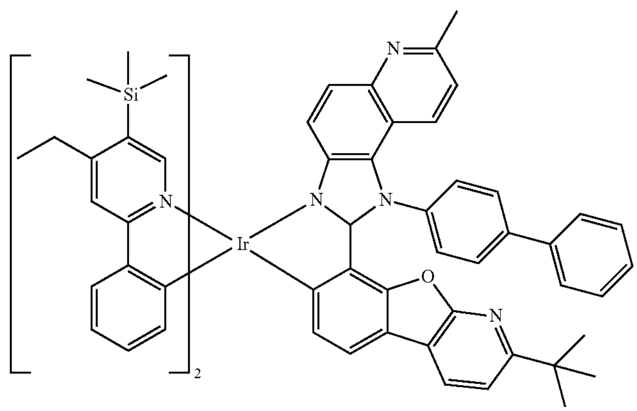
875
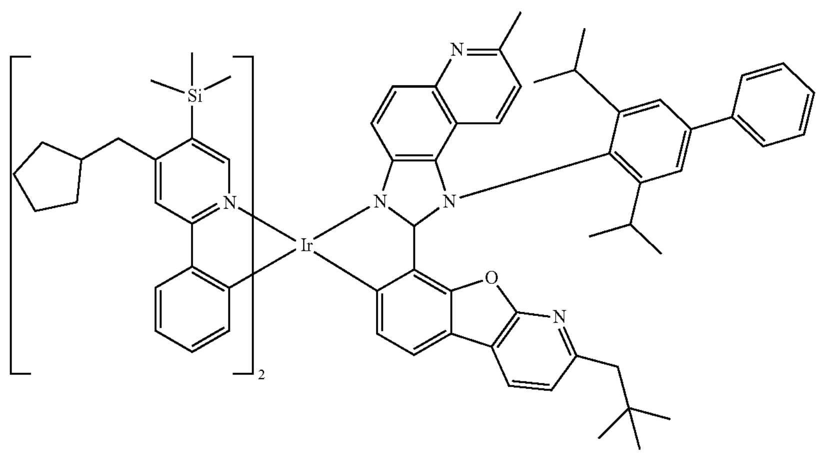
876
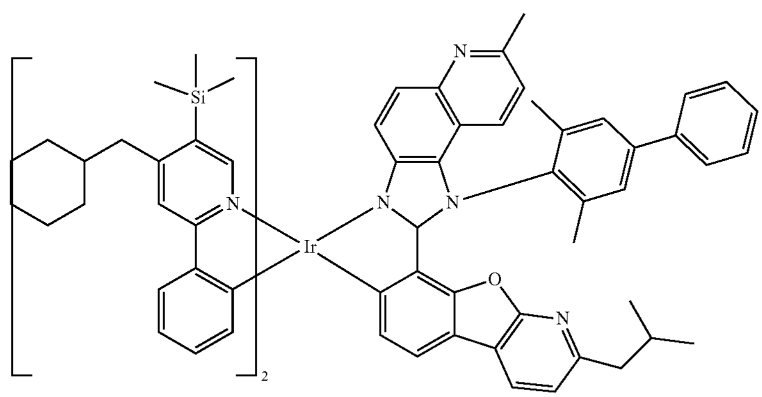
877
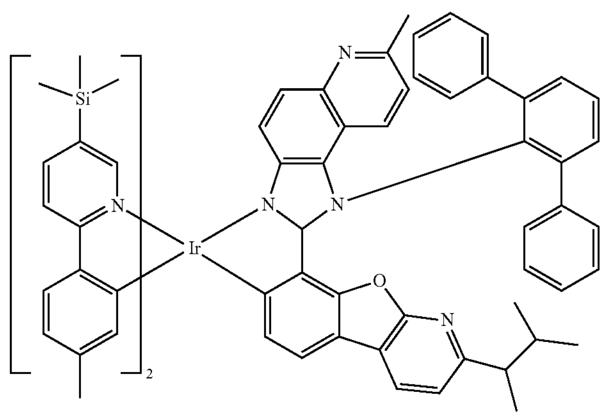

-continued
878
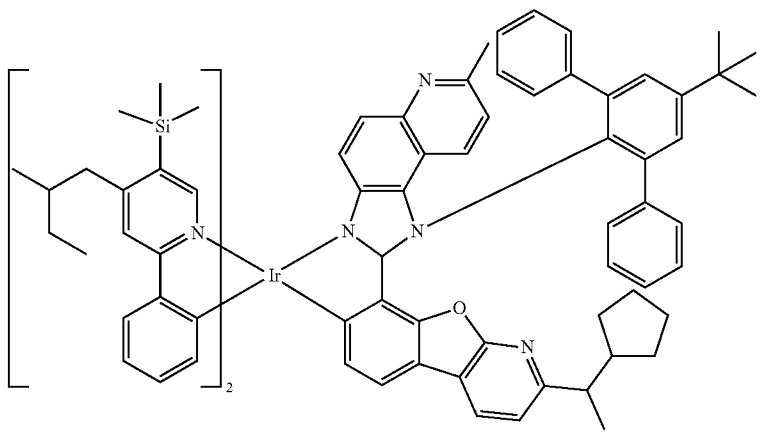
879
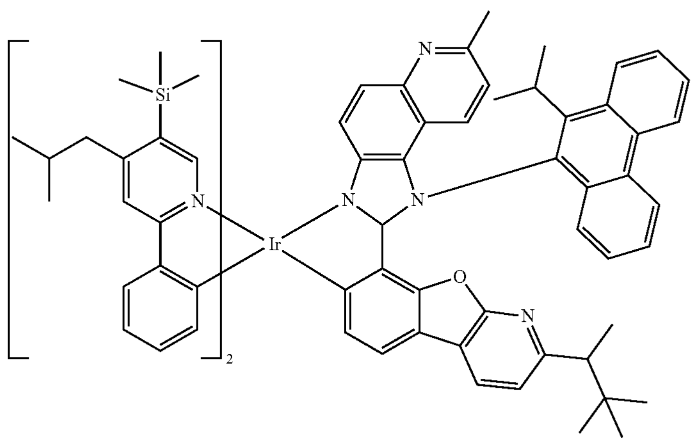
880
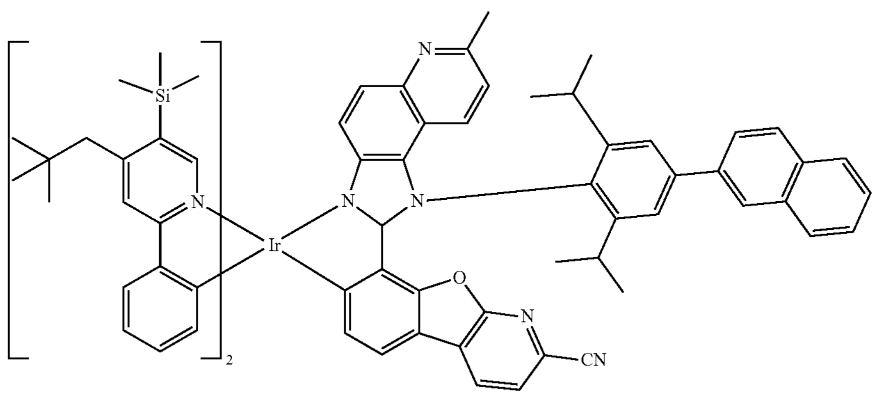
881
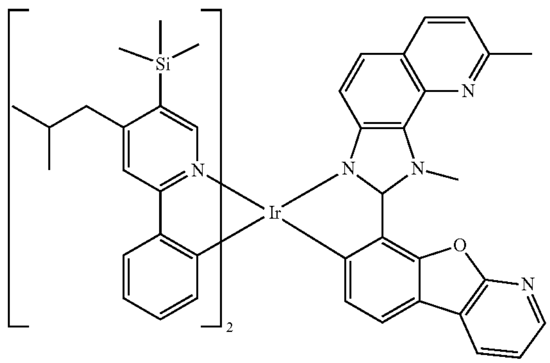

-continued
882
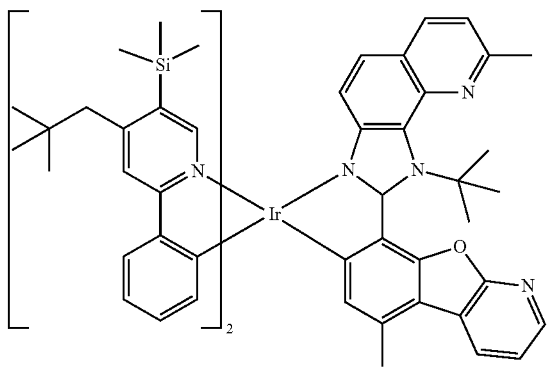
883
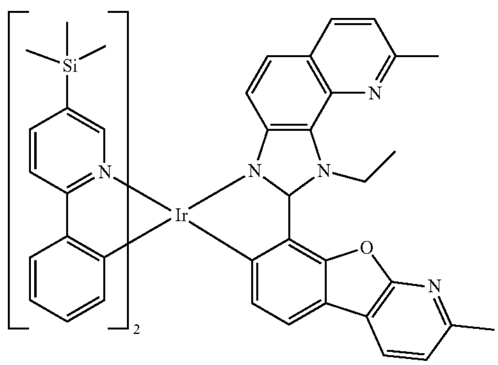
884
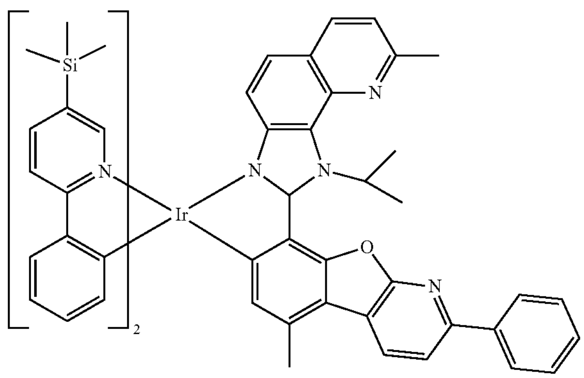
885
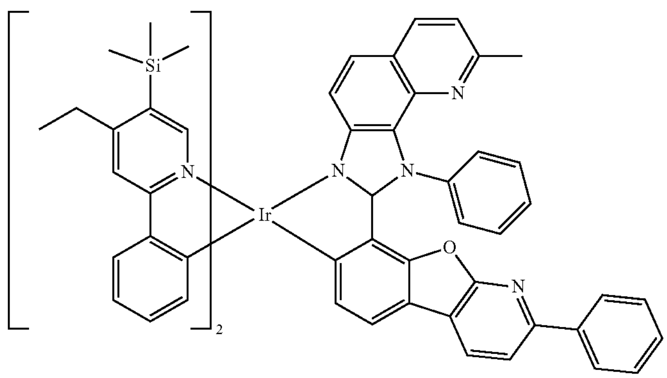

-continued
886
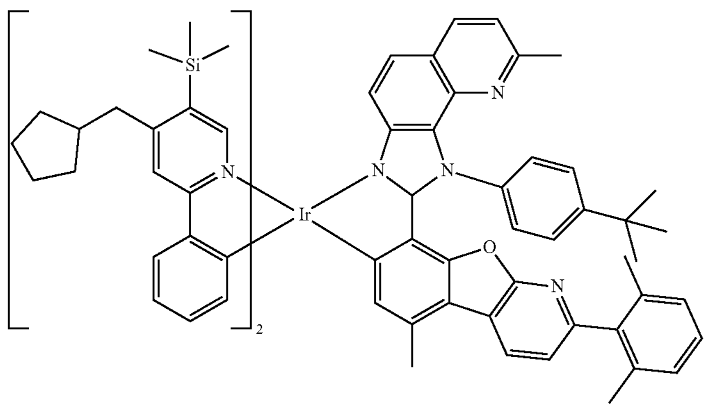
887
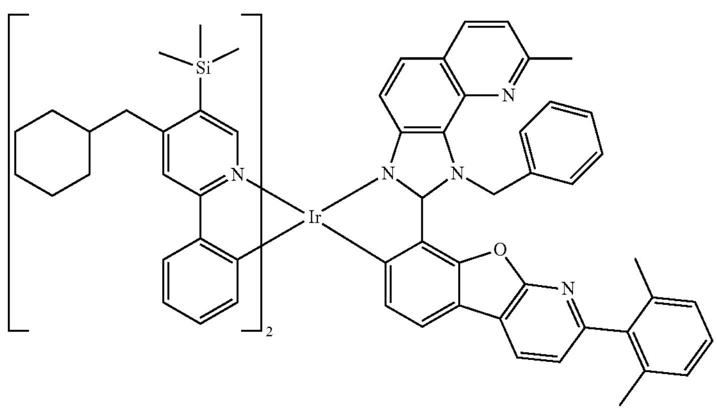
888
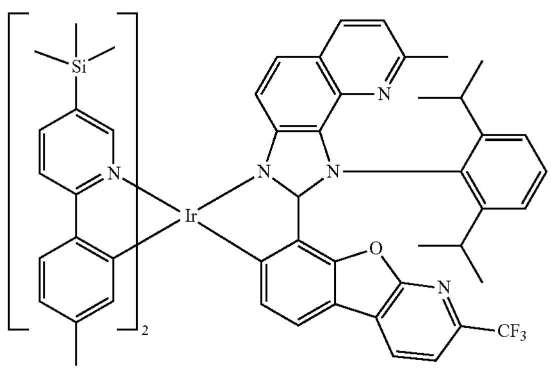
889
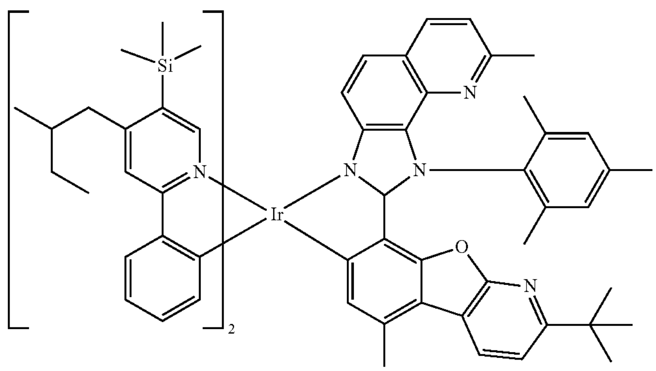

-continued
890
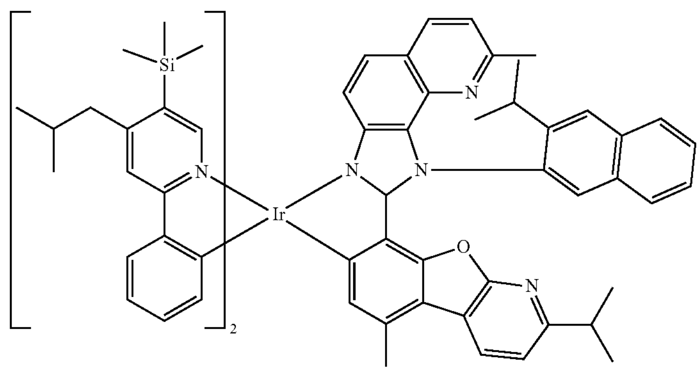
891
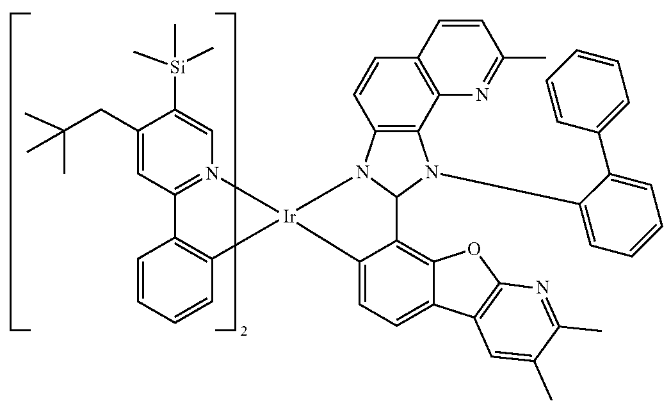
892
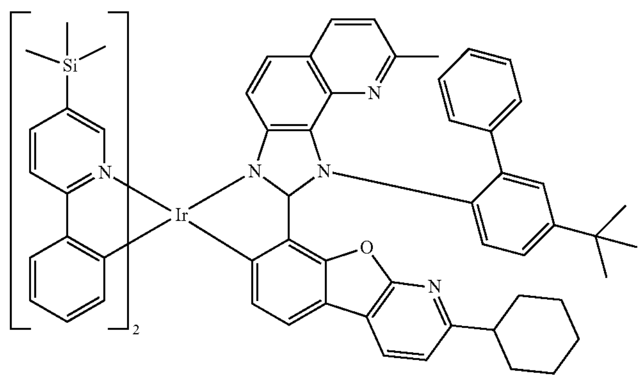
893
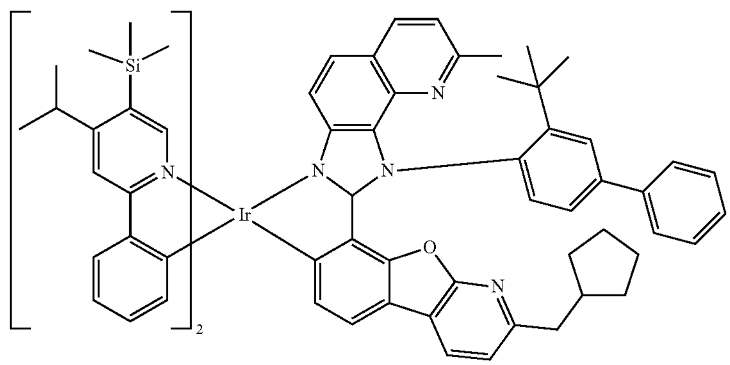

-continued
894
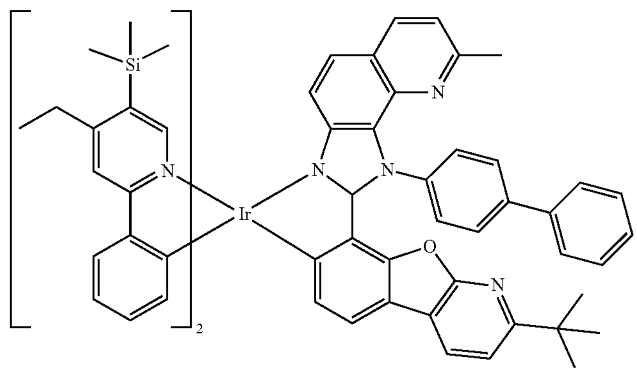
896
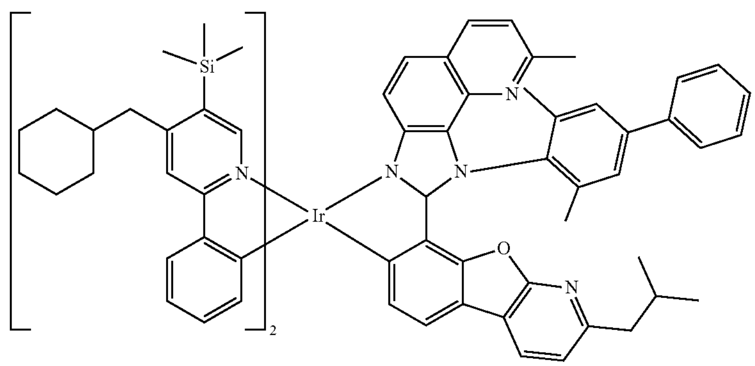
897
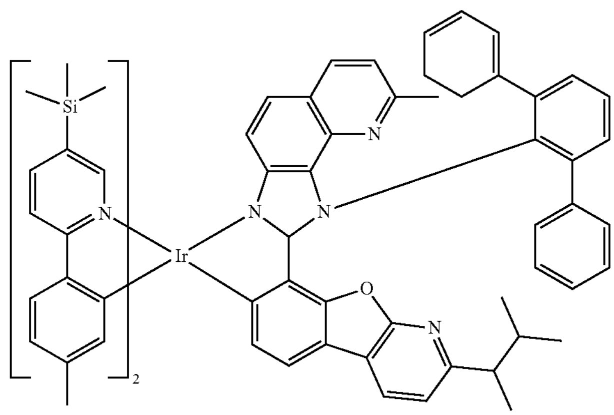
898
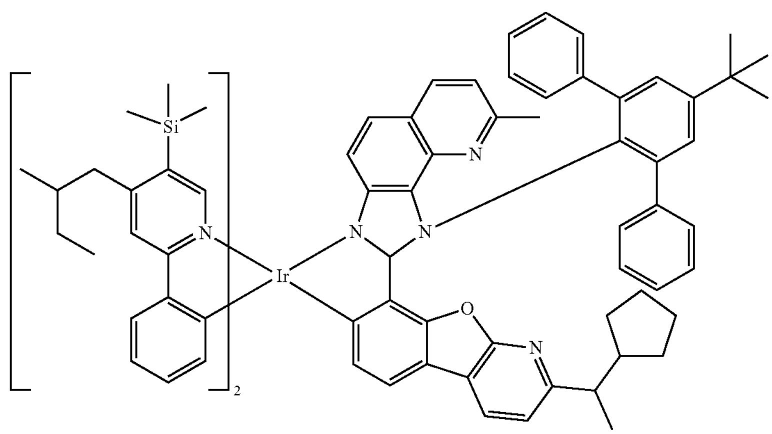

-continued
899
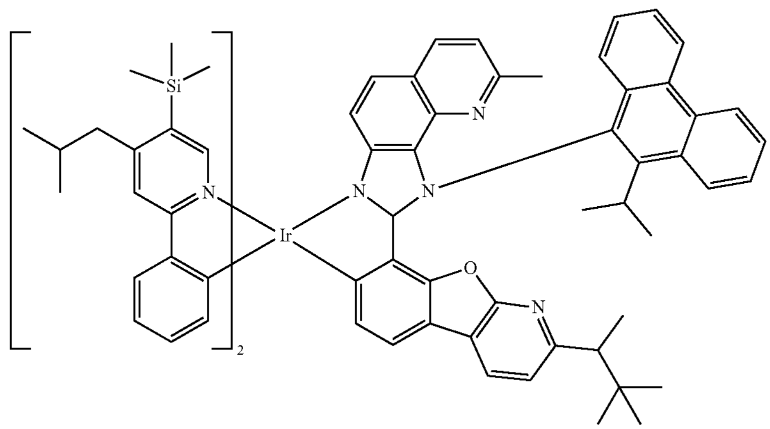
900
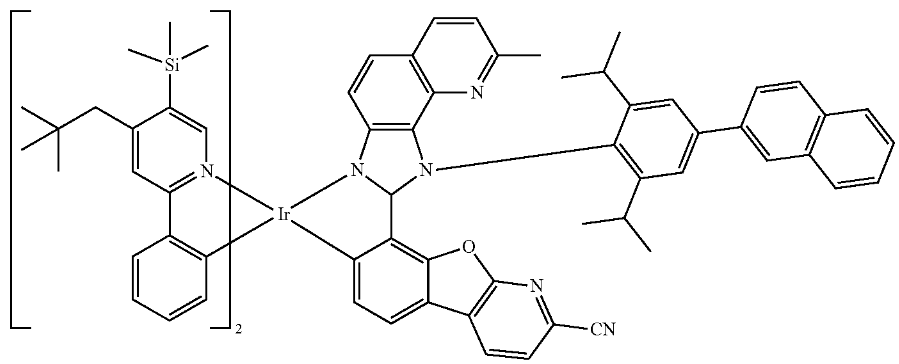
901
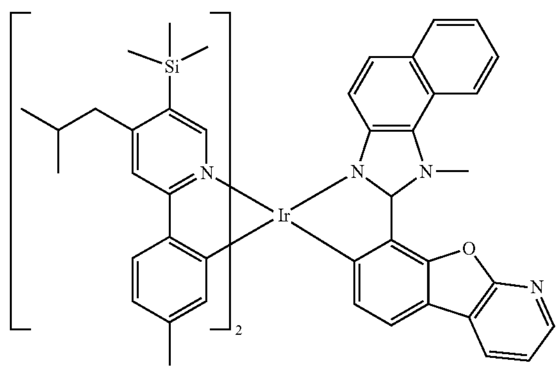
902
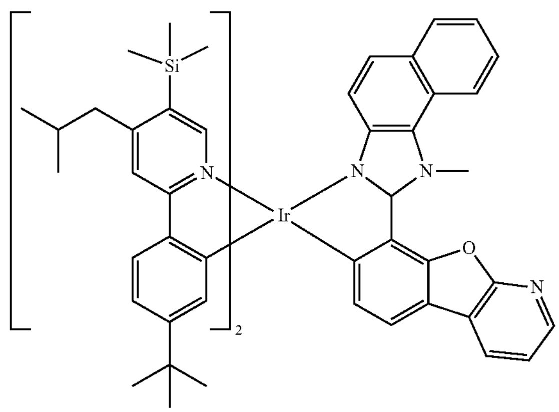

-continued
903
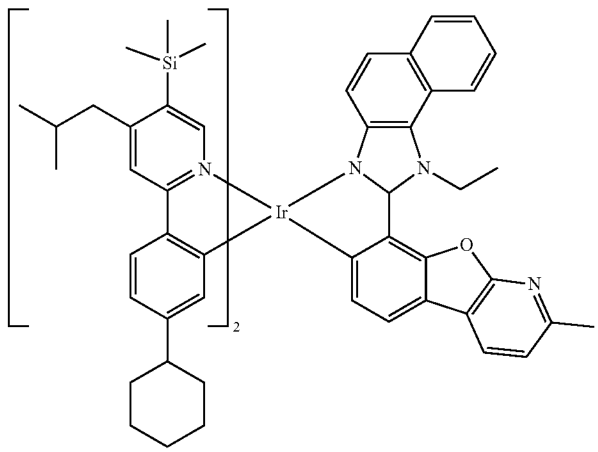
904
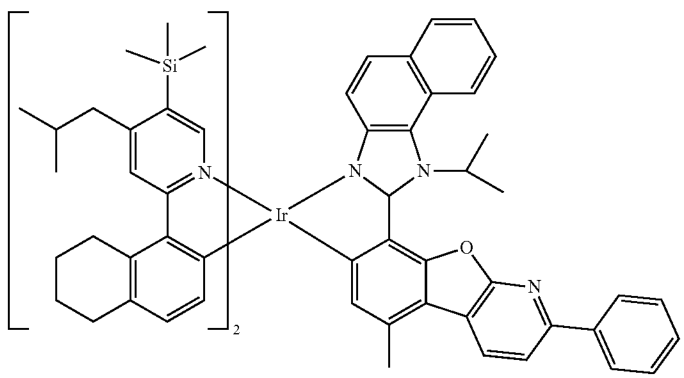
905
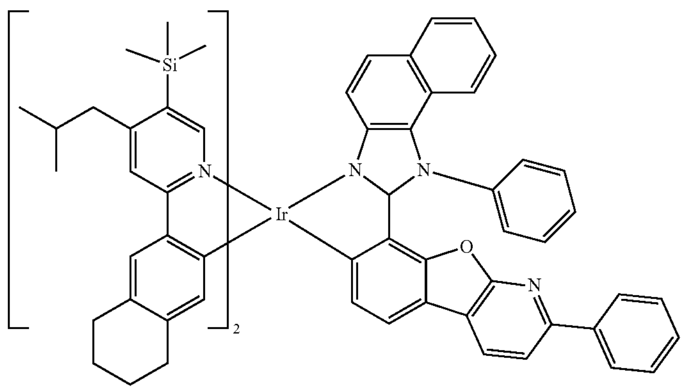
906
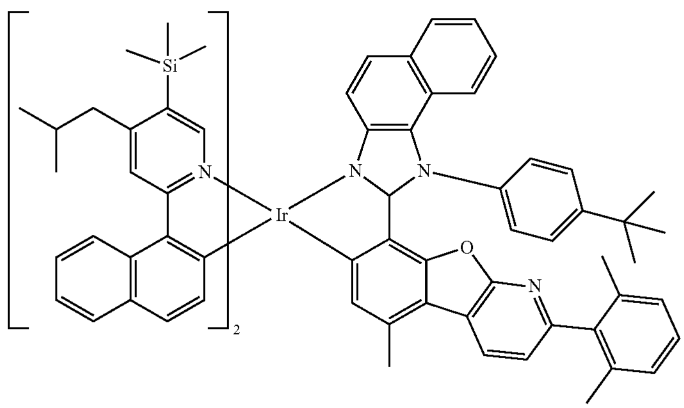

-continued
907
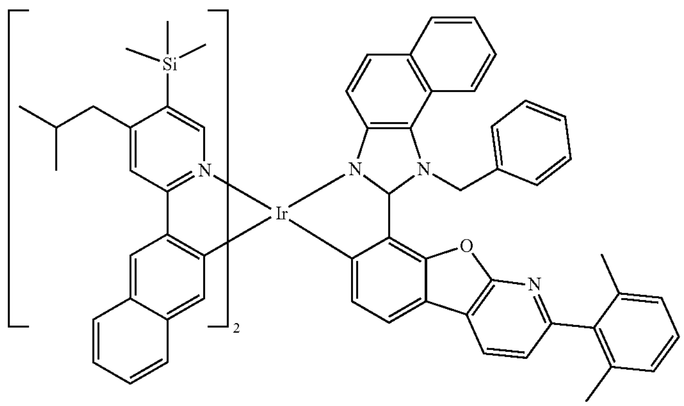
908
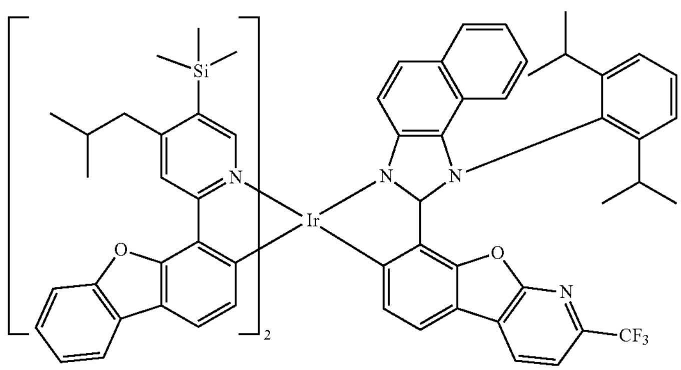
909
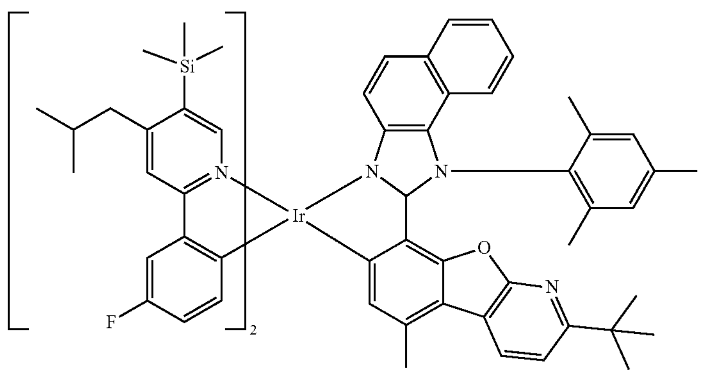
910
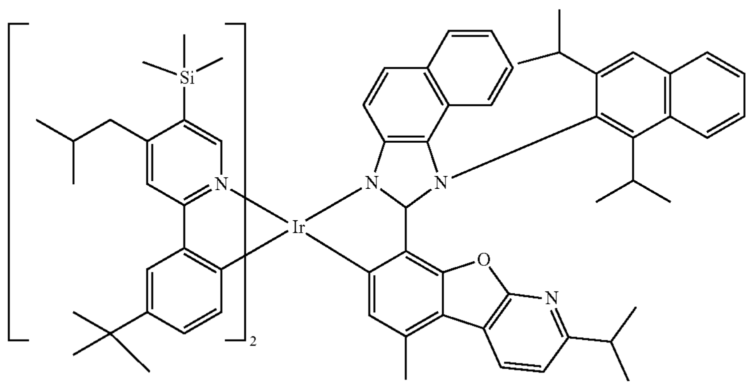

-continued
911
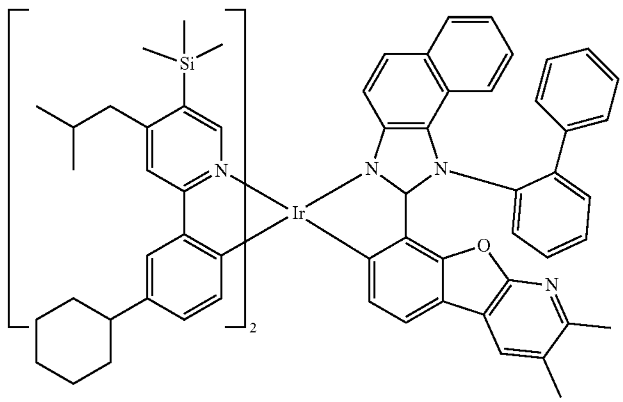
912
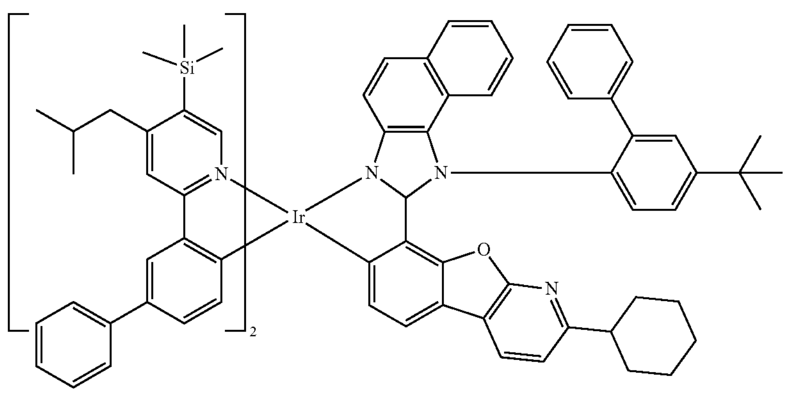
913
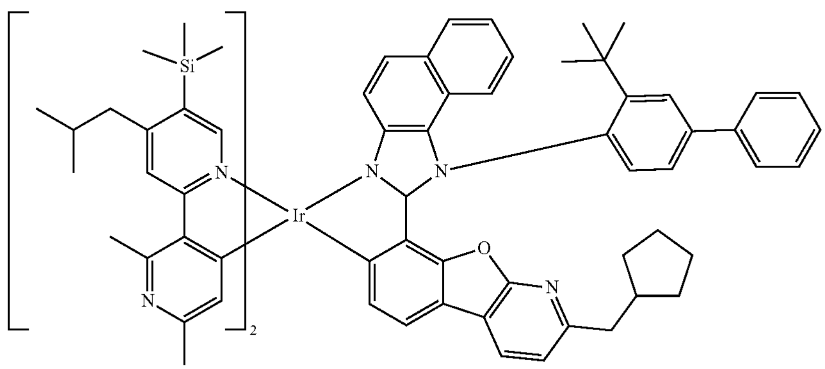
914
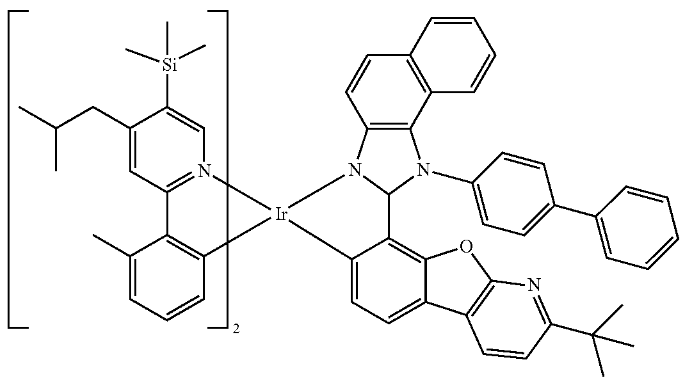

-continued
915
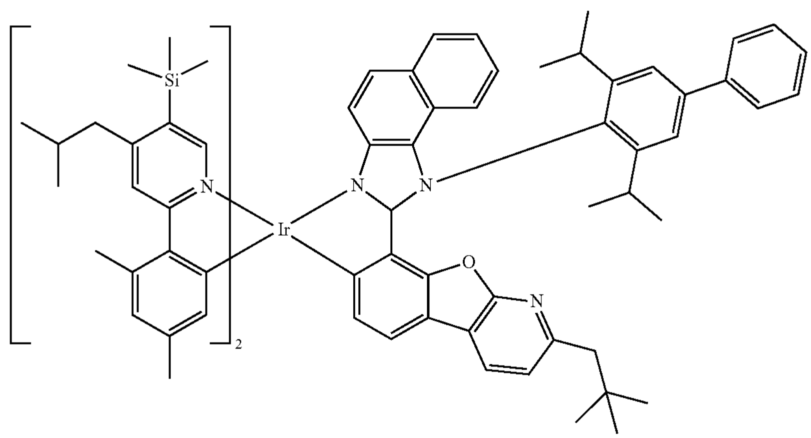
916
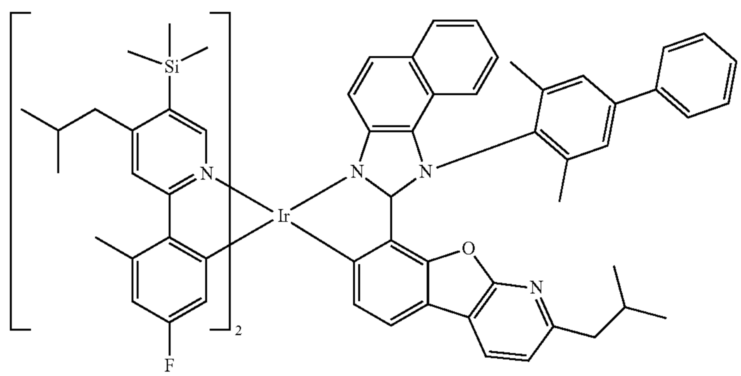
917
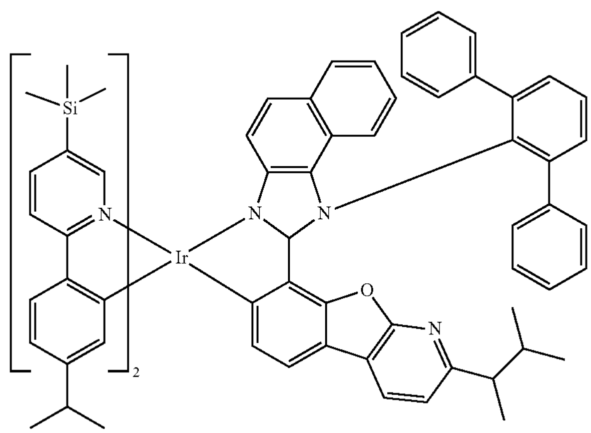

-continued
918
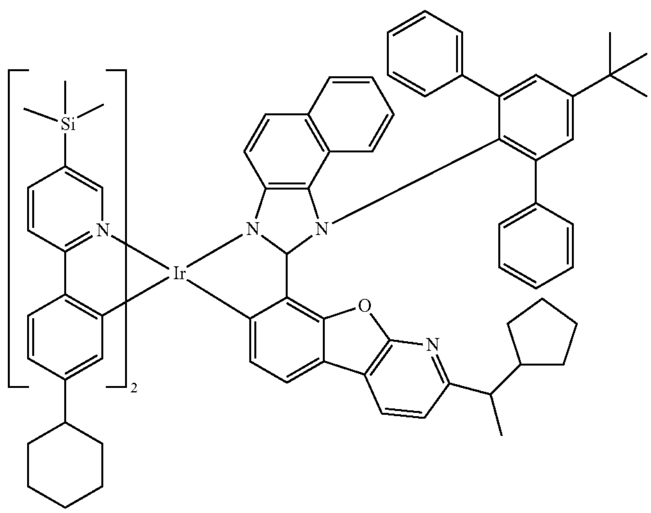
919
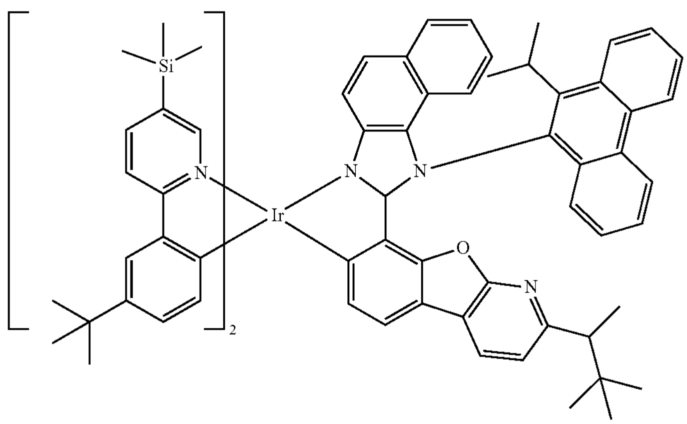
920
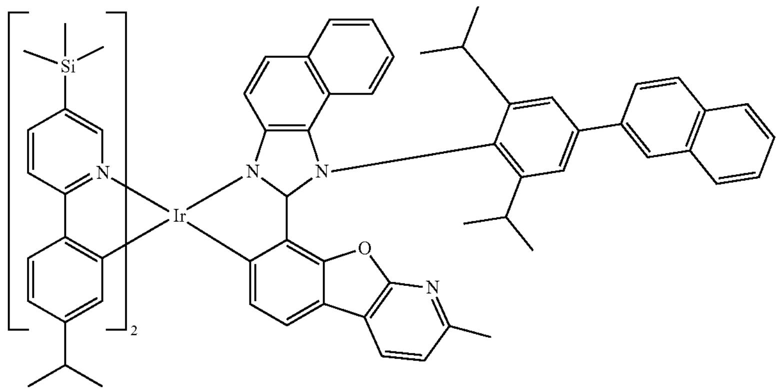

-continued
921
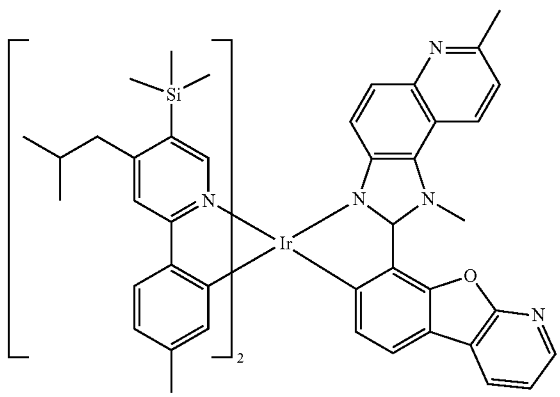
922
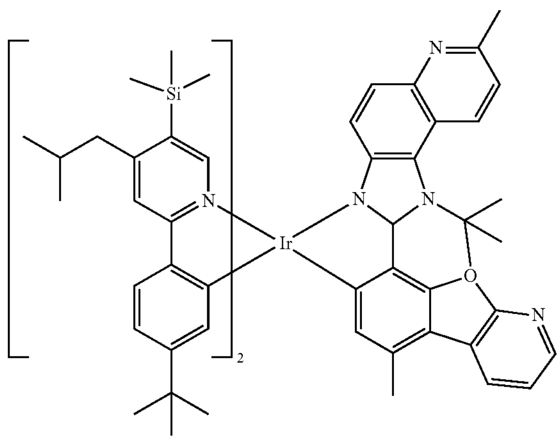
923
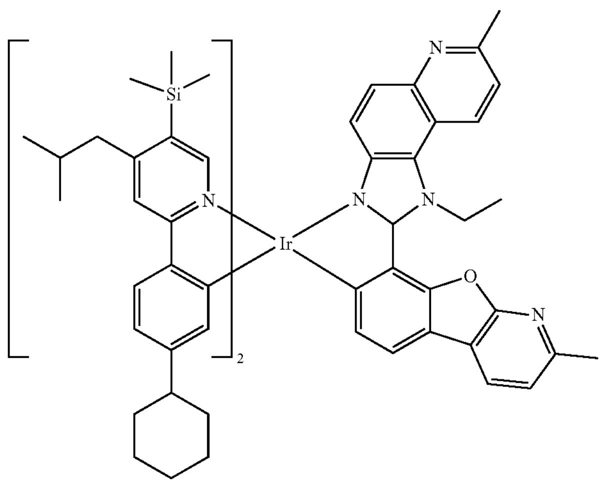

-continued
924
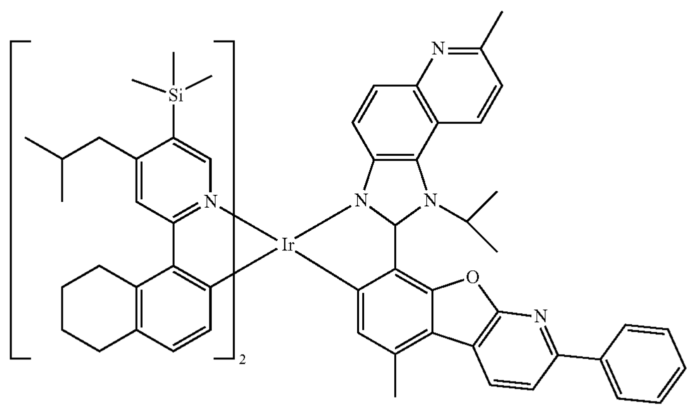
925
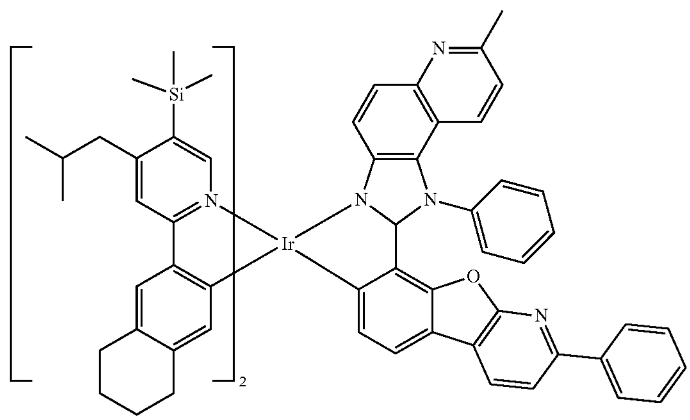
926
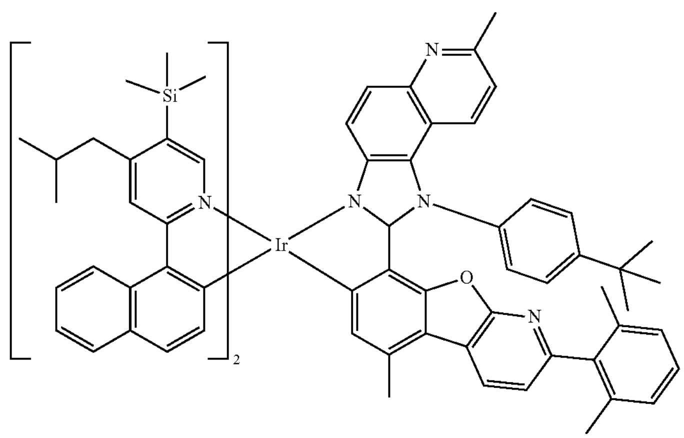

-continued
927
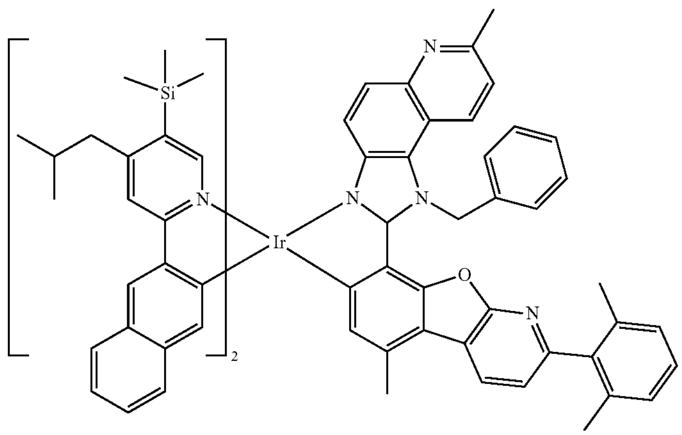
928
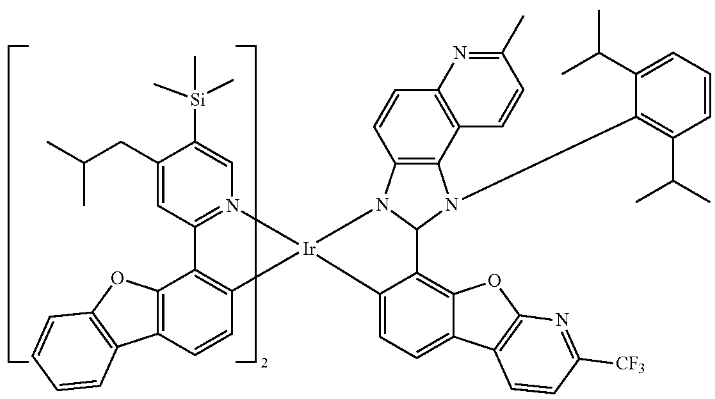
929
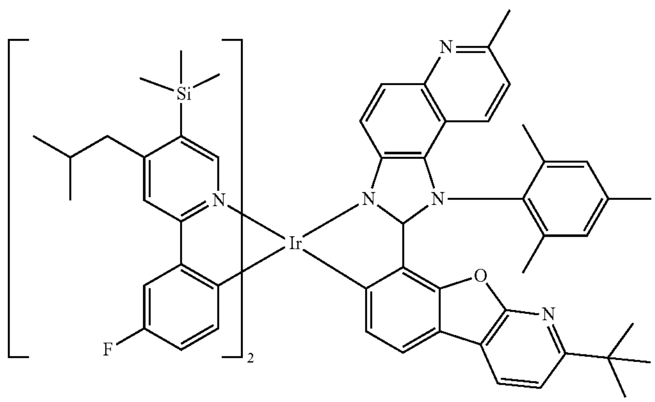
930
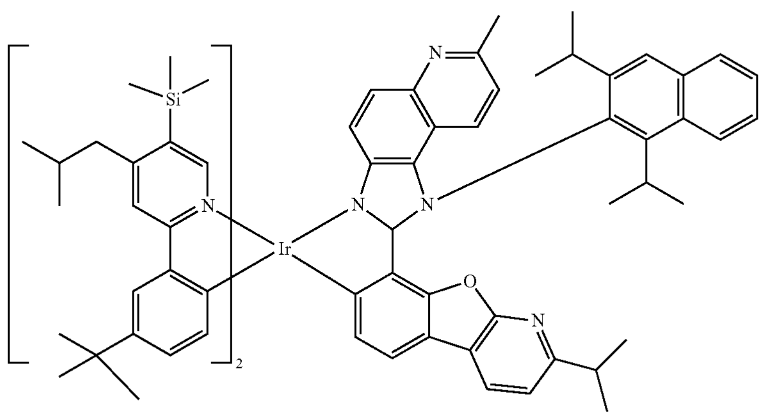

-continued
931
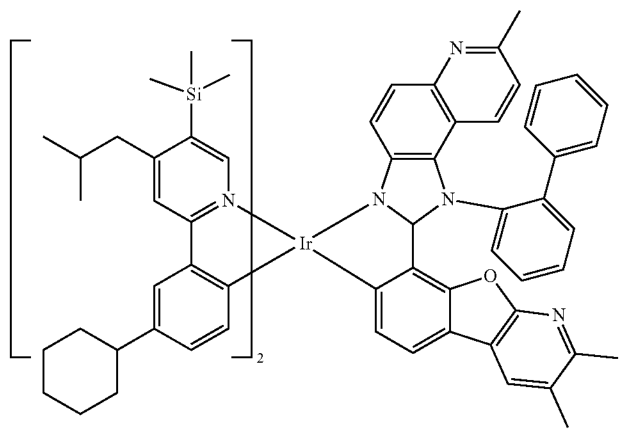
932
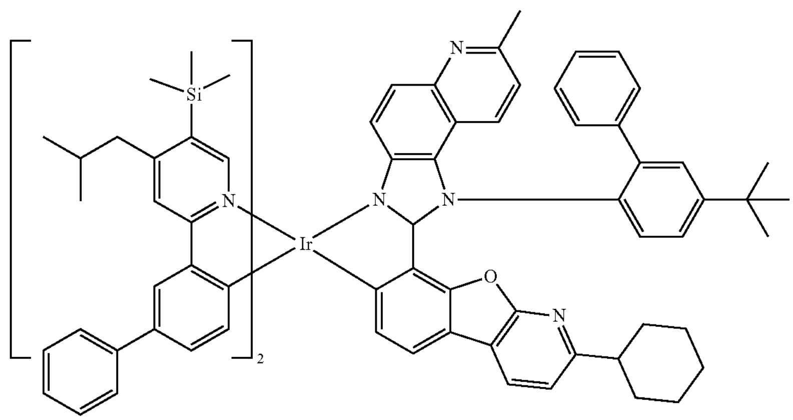
933
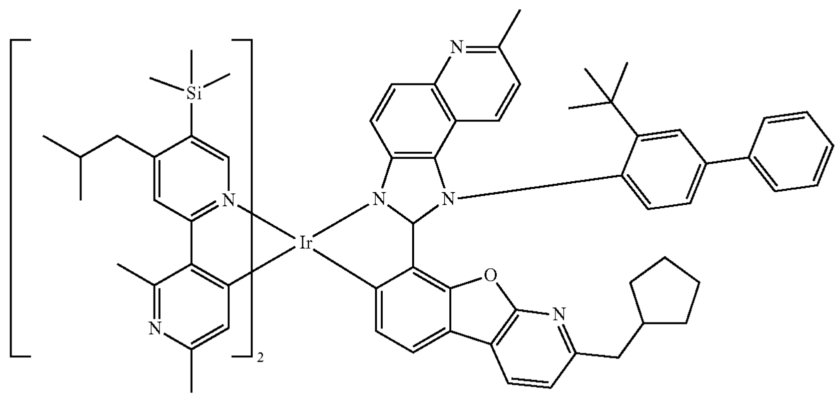
934
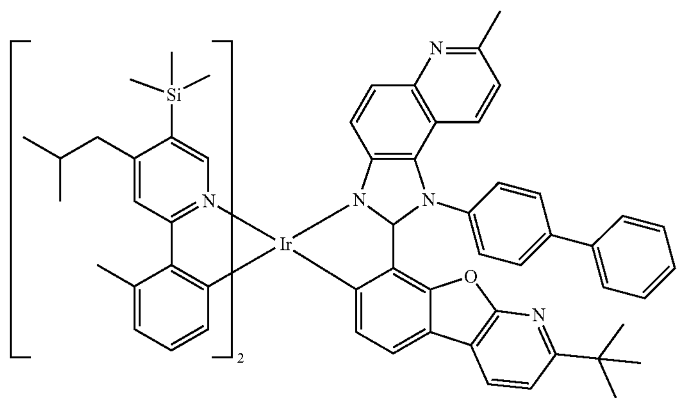

-continued
935
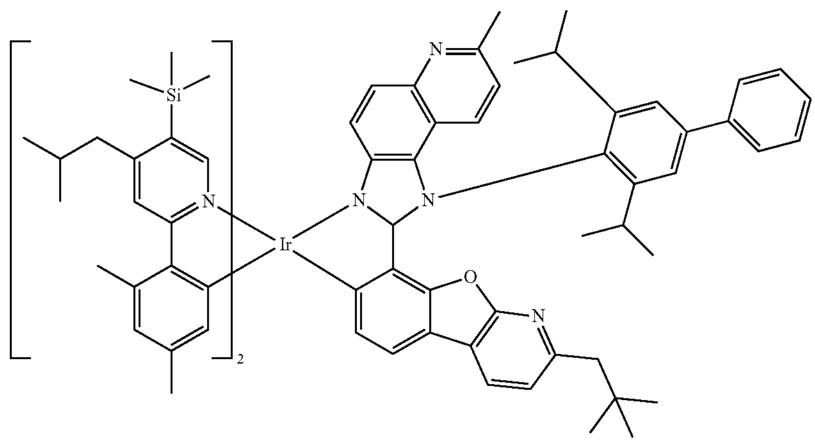
936
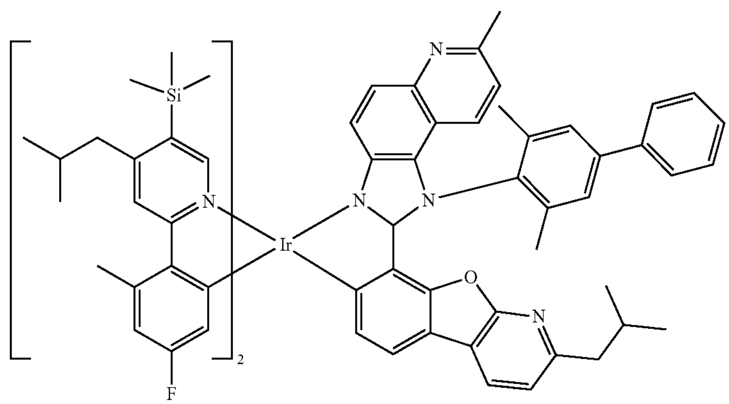
937
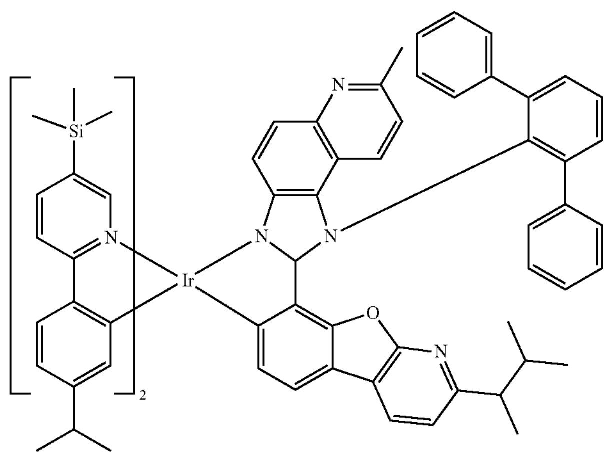

-continued
938
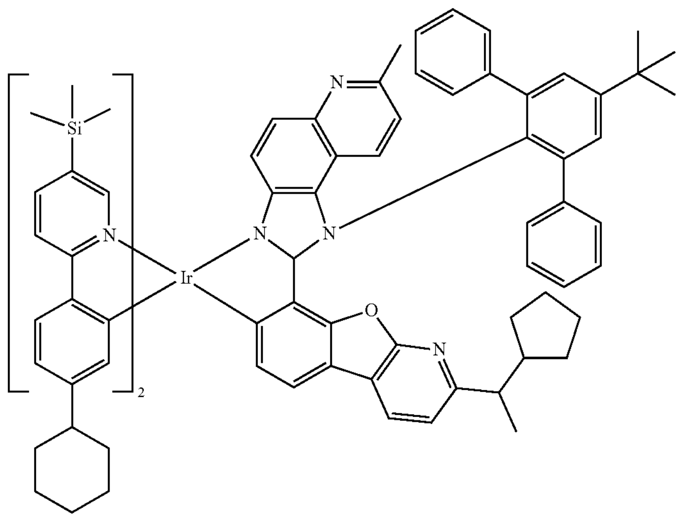
939
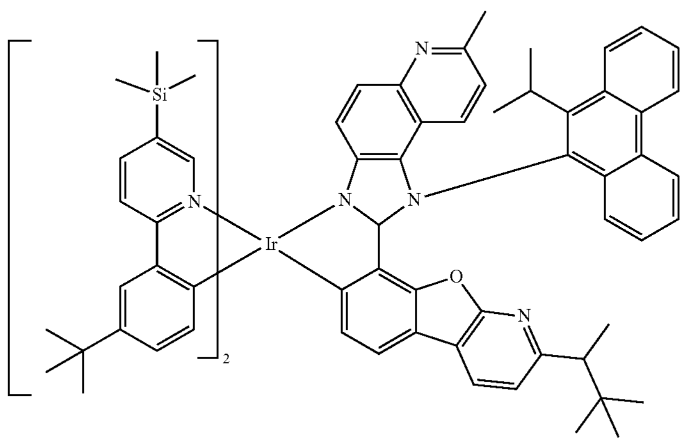
940
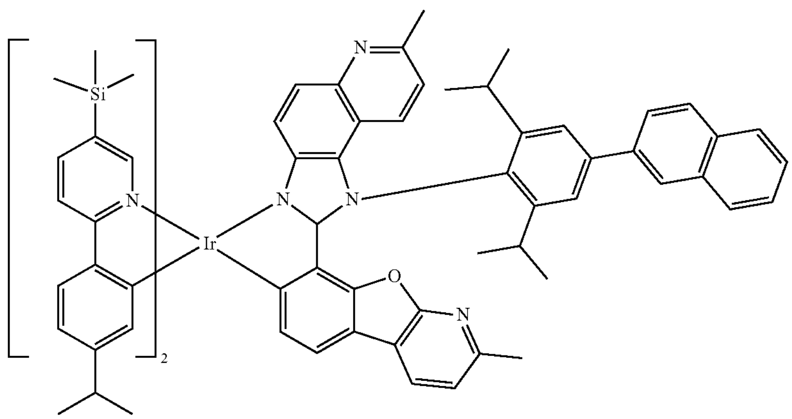

-continued
941
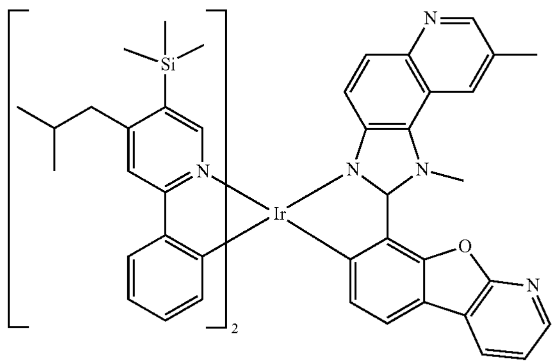
942
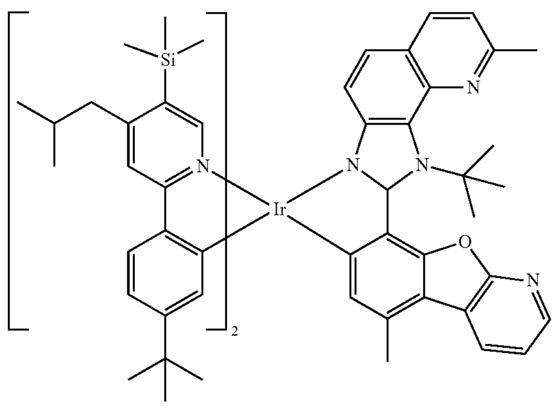
943
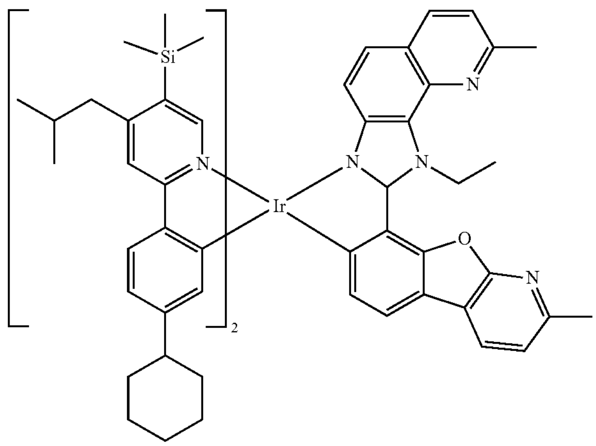
944
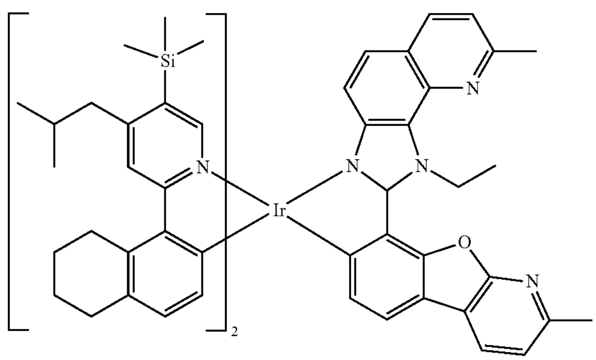

-continued
945
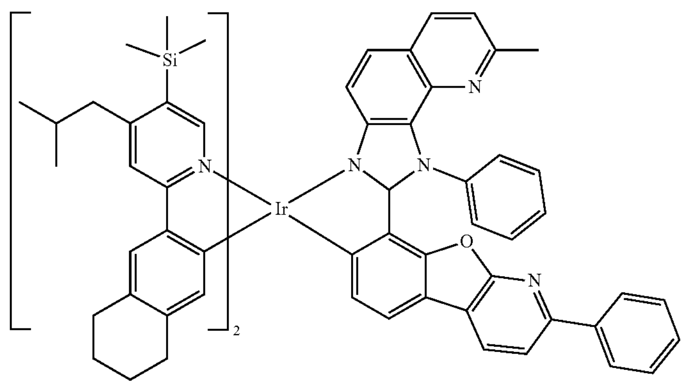
946
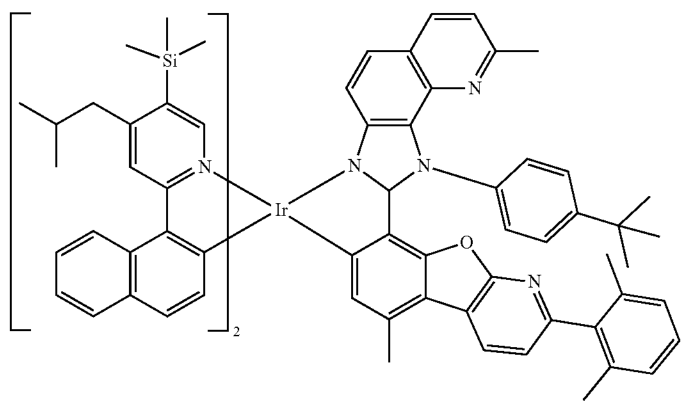
947
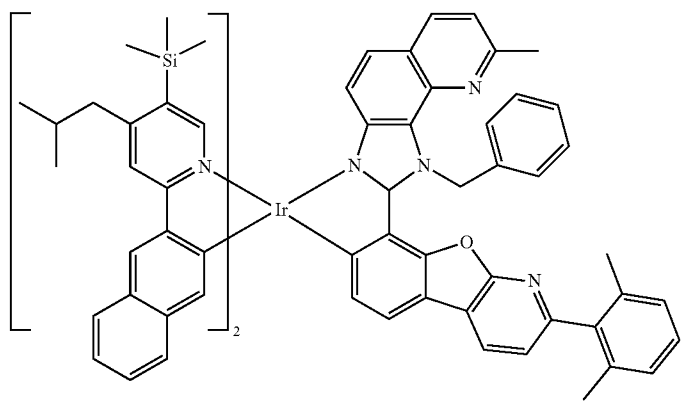
948
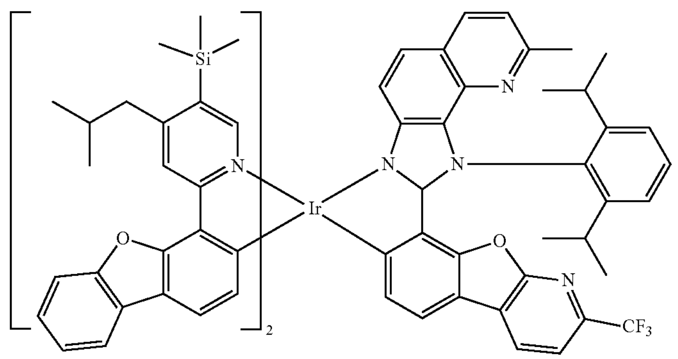

-continued
949
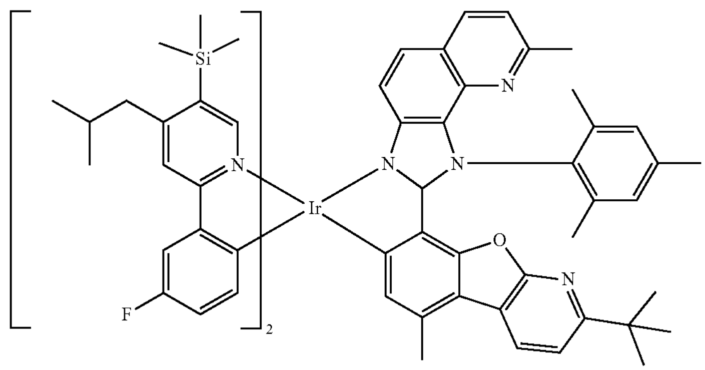
950
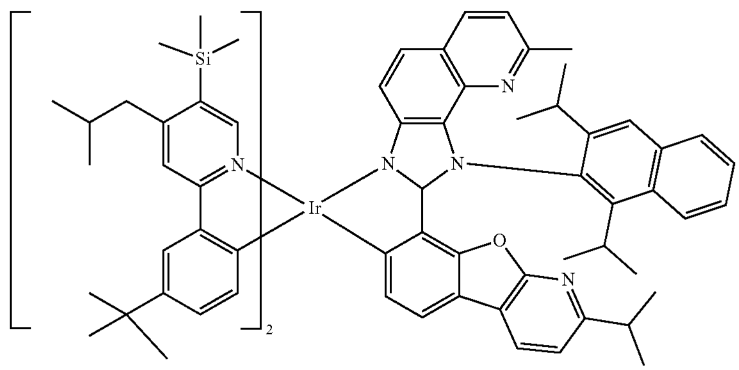
951
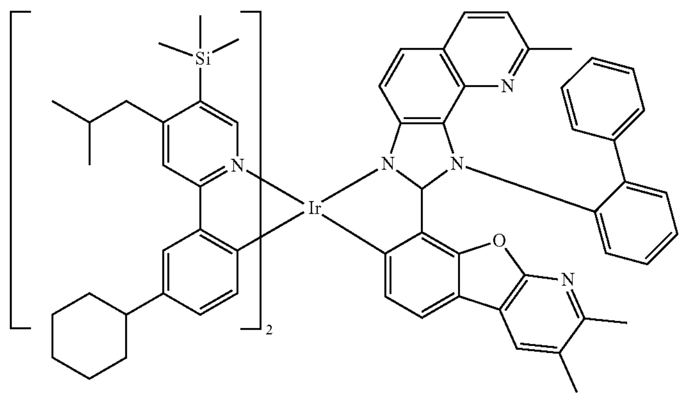
952
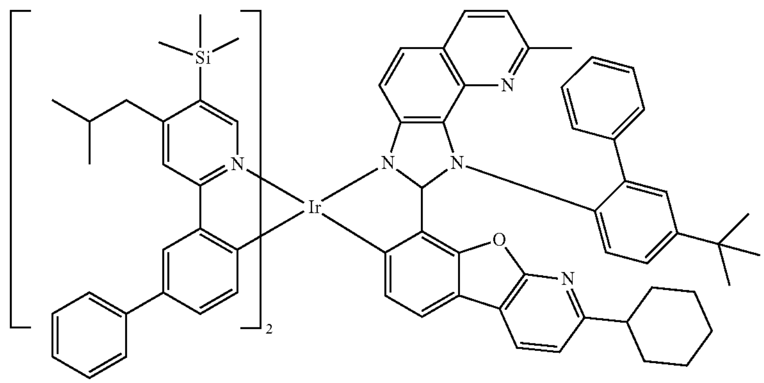

-continued
953
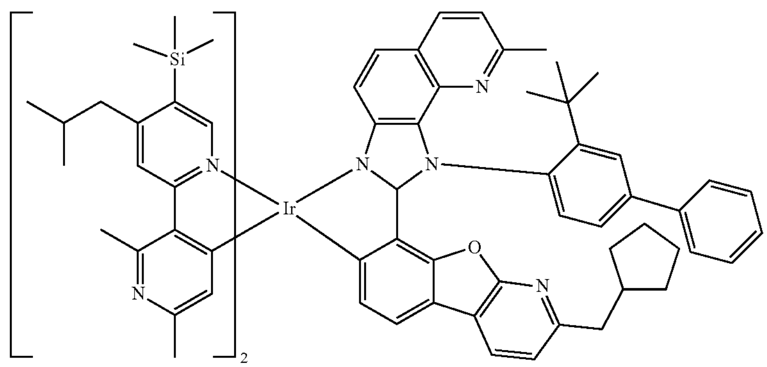
954
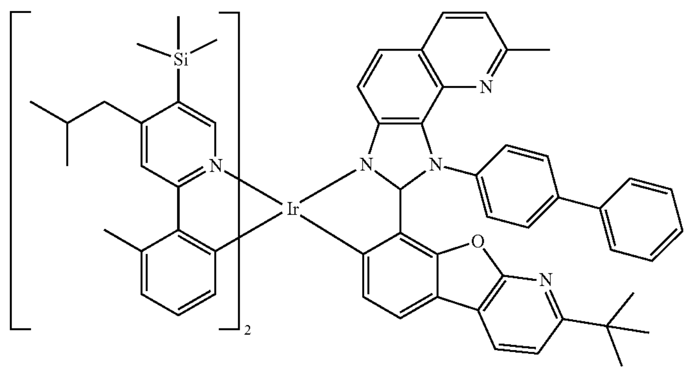
955
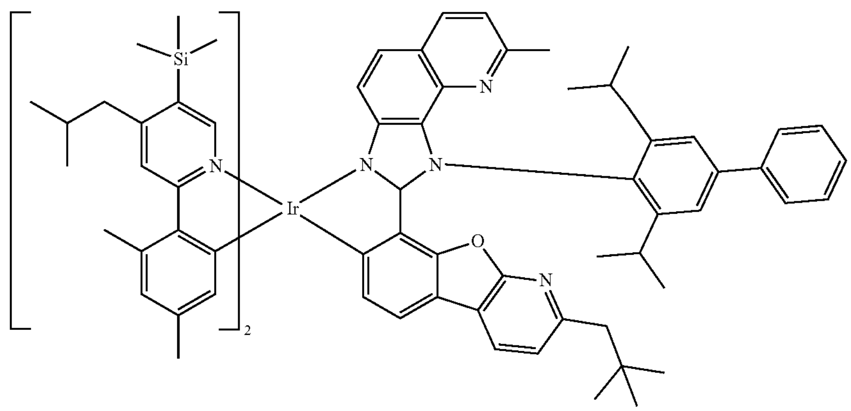
956
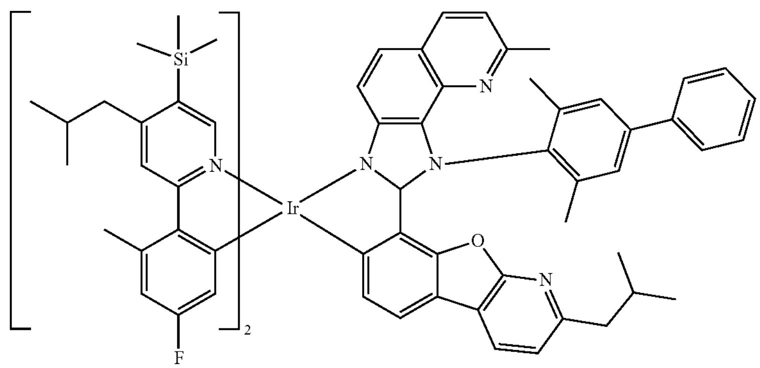

-continued
957
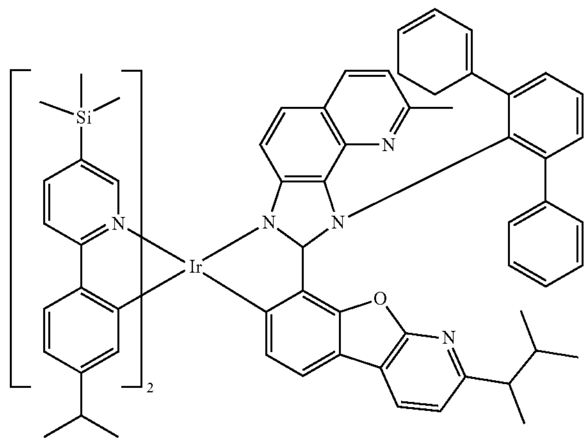
958
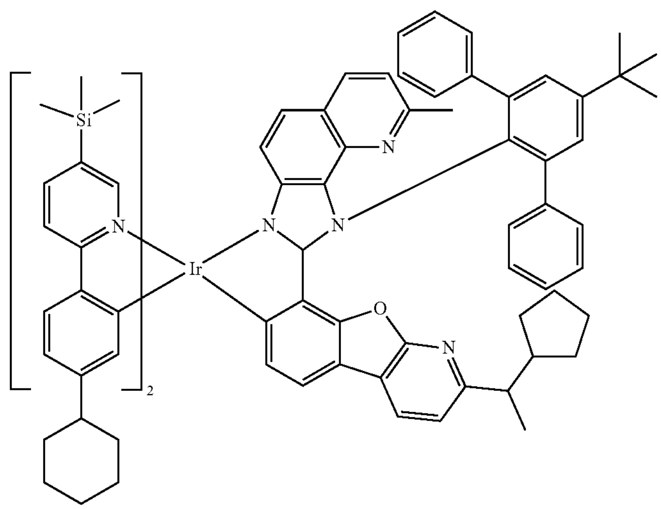
959
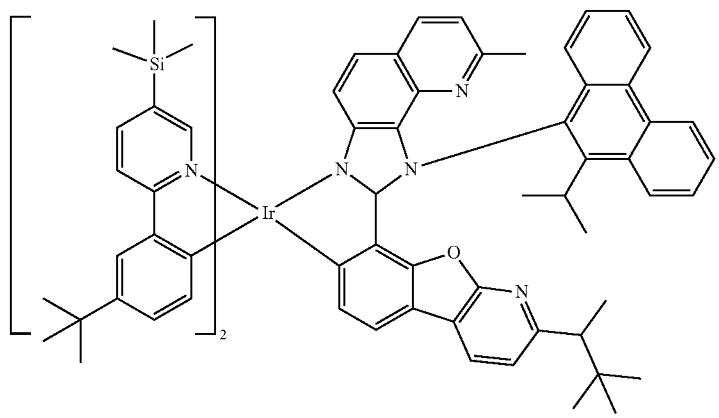

-continued
960
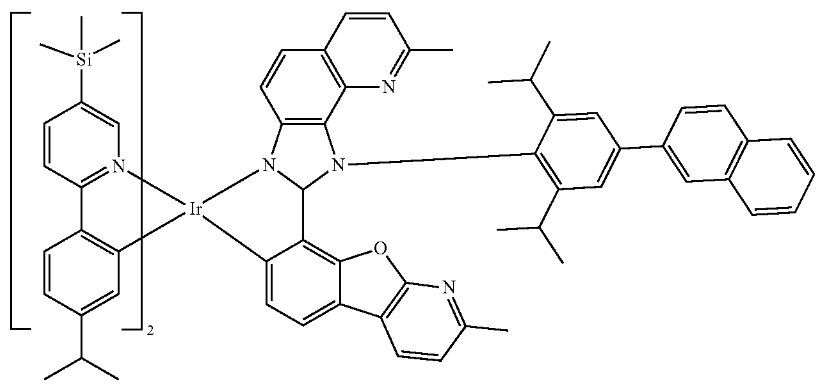
961
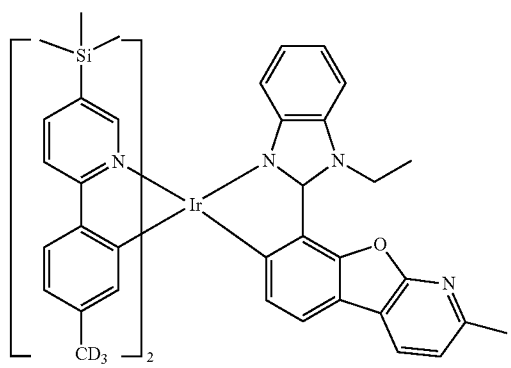
962
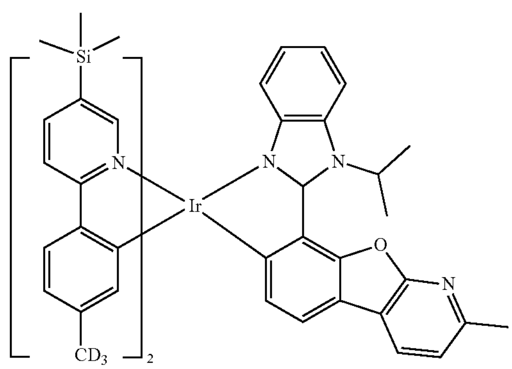
963
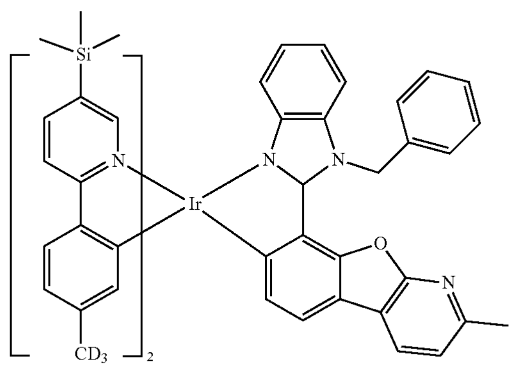

-continued
964
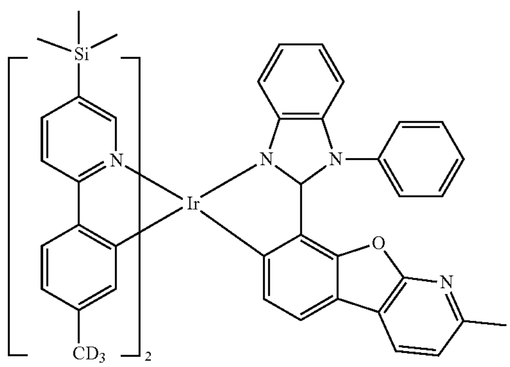
965
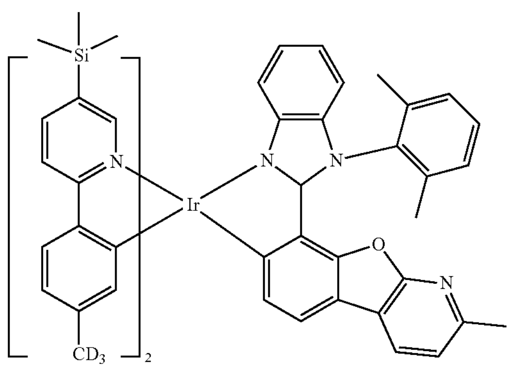
966
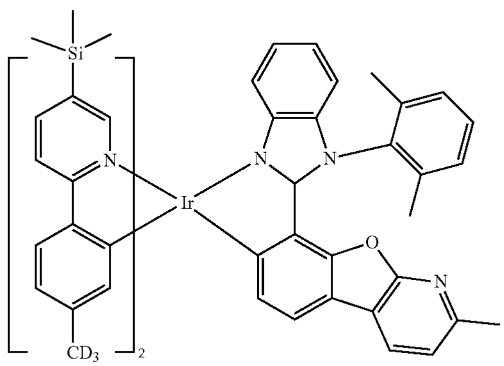
967
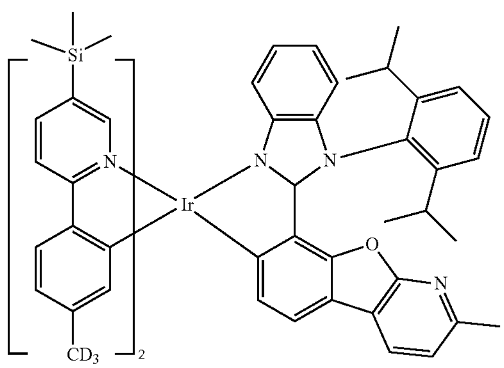

-continued
968
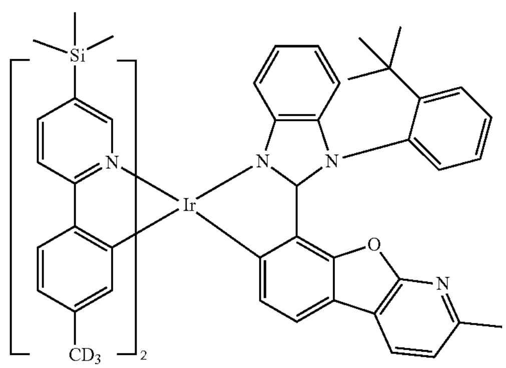
969
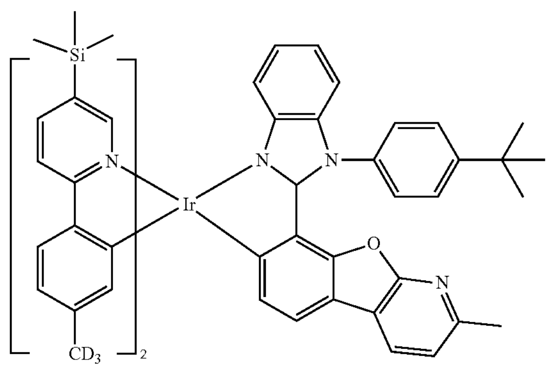
970
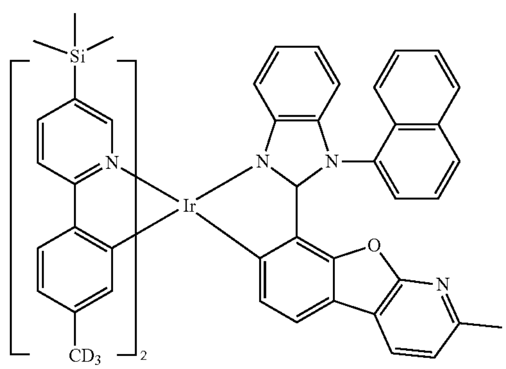
971
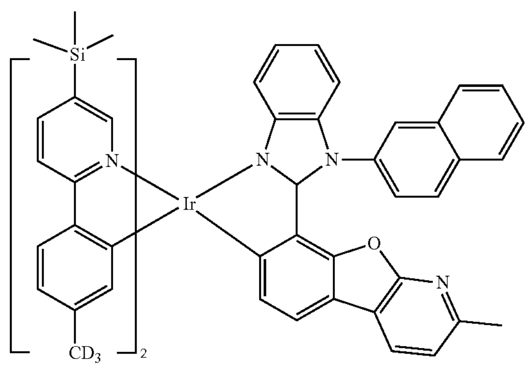
971

-continued
972
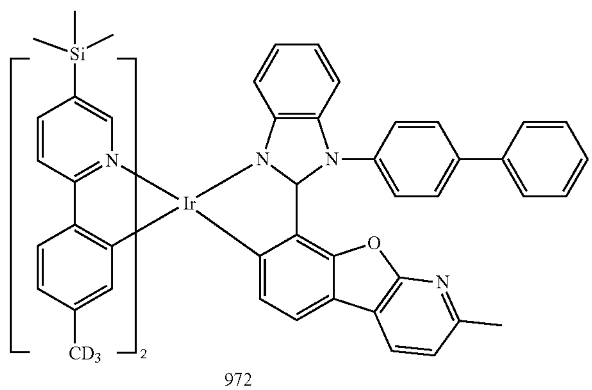
972
973
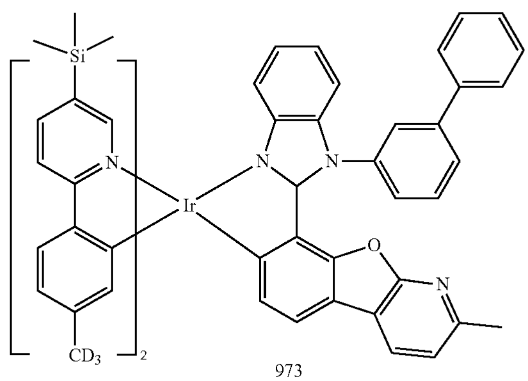
973
974
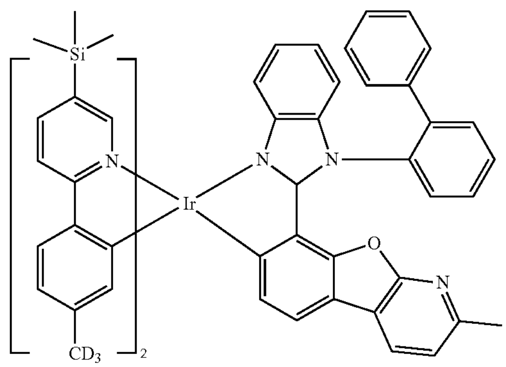
975
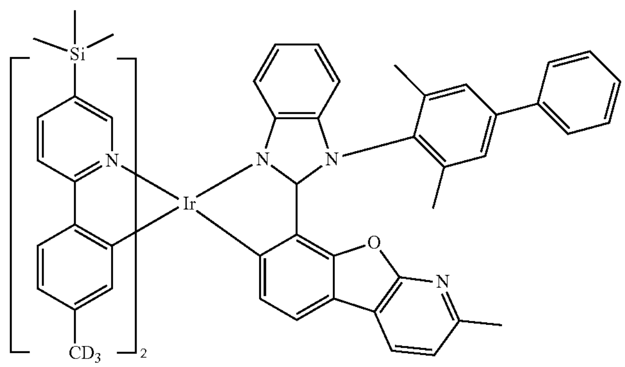

-continued
976
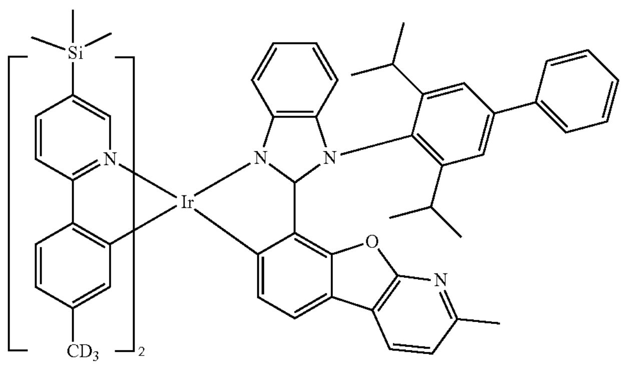
977
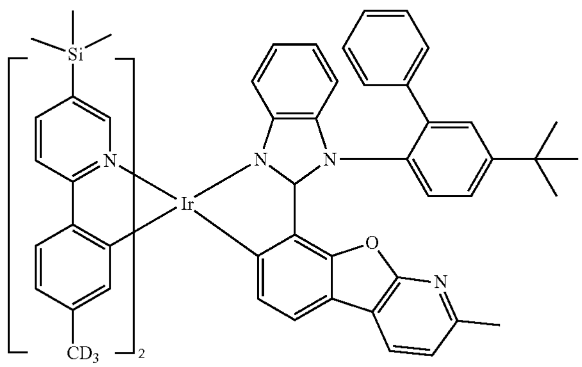
978
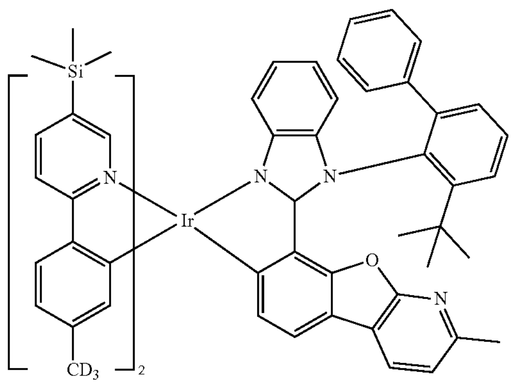
979
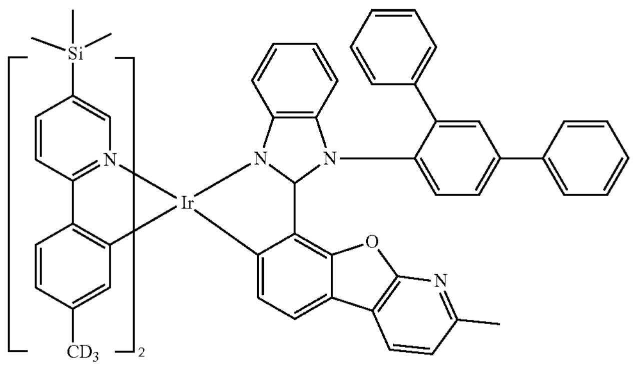

-continued
980
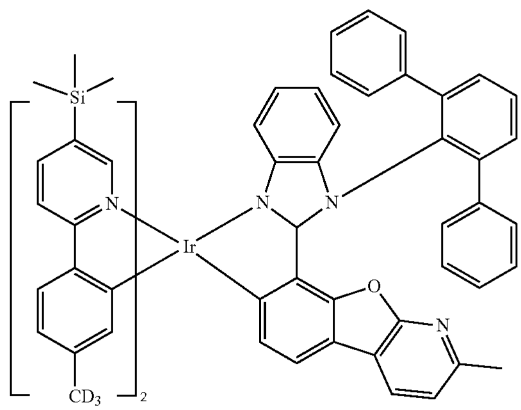
981
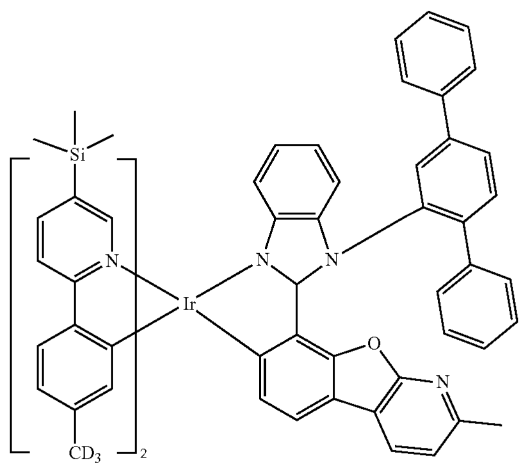
982
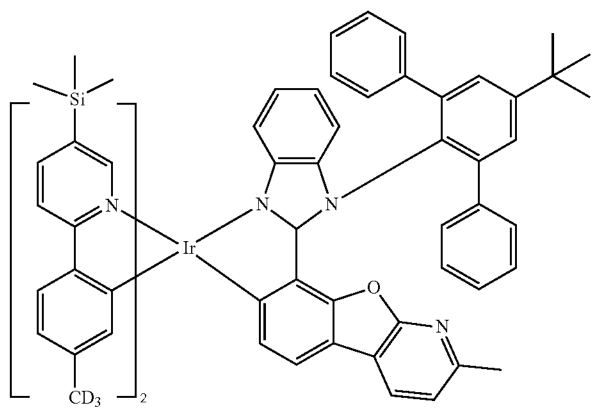

-continued
983
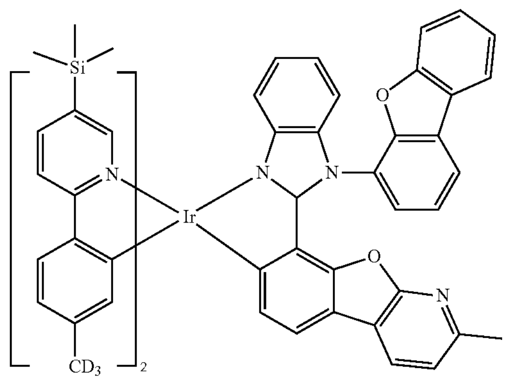
984
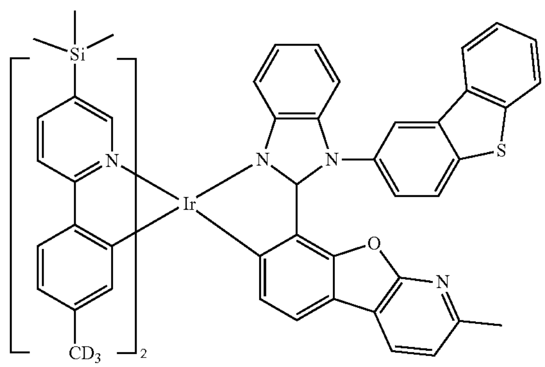
985
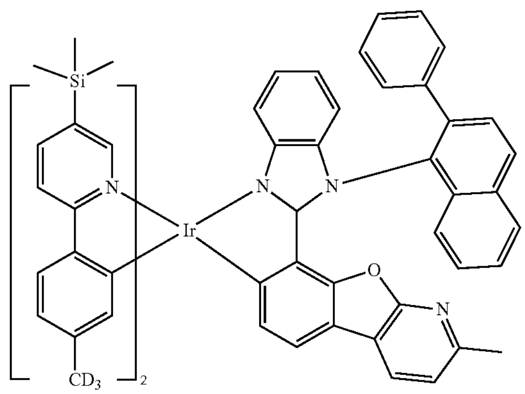
986
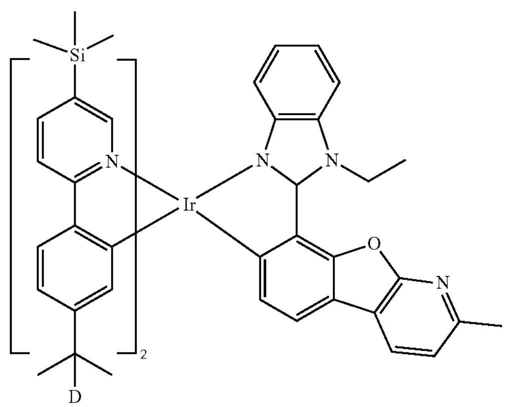

-continued
987
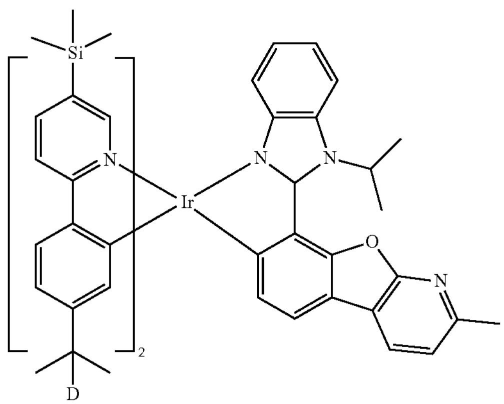
988
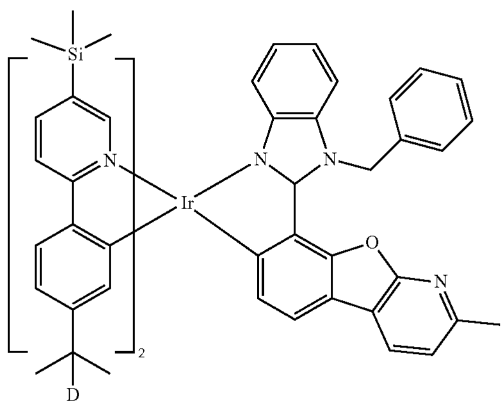
989
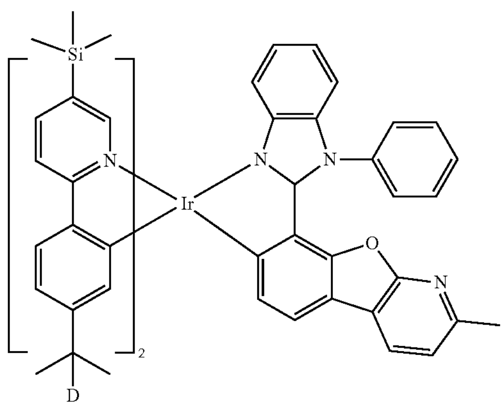
990
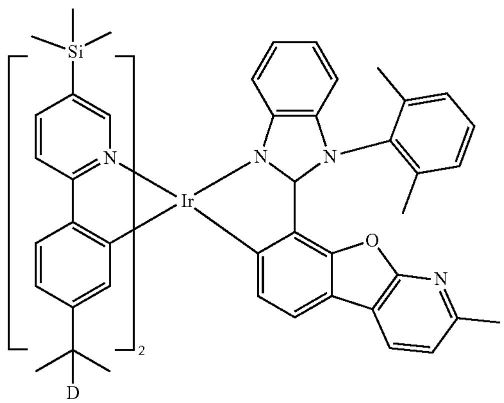

-continued
991
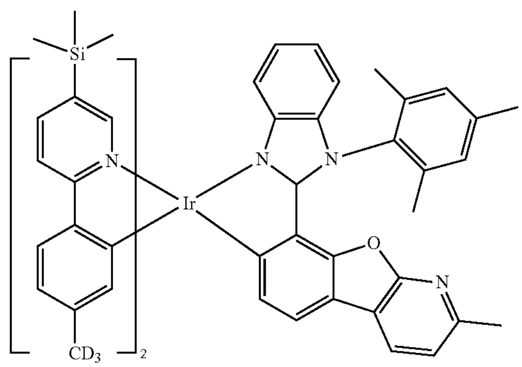
992
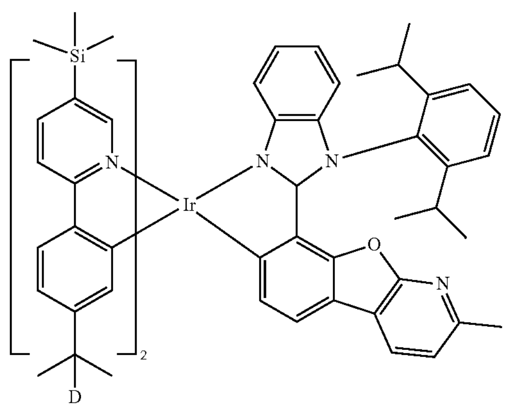
993
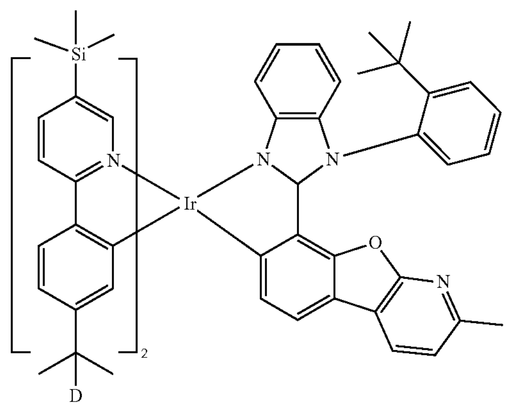
994
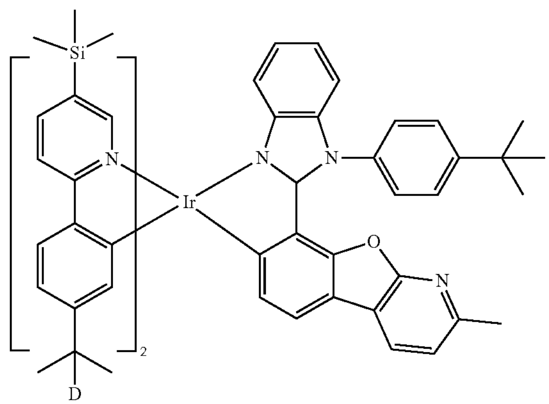

-continued
995
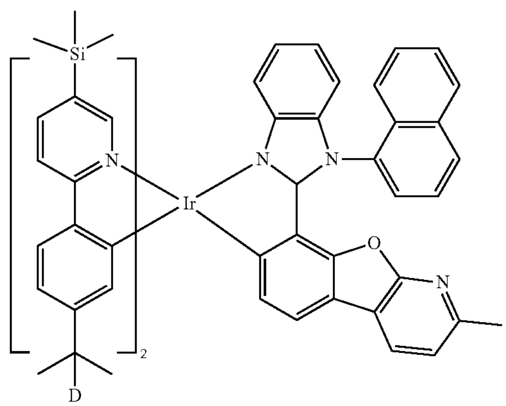
996
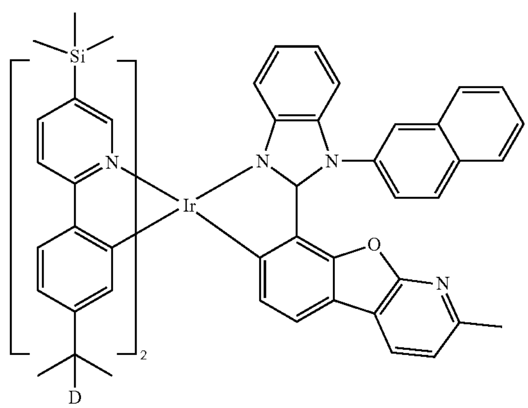
997
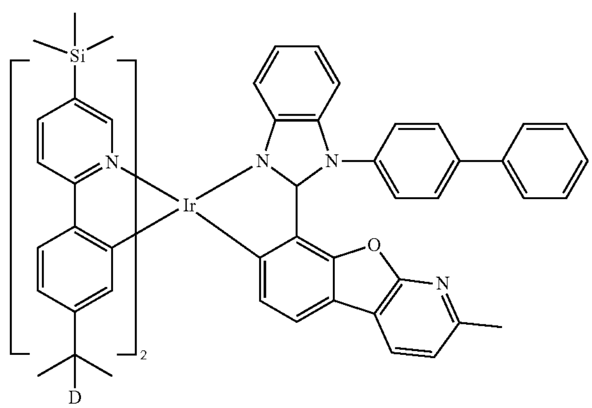
998
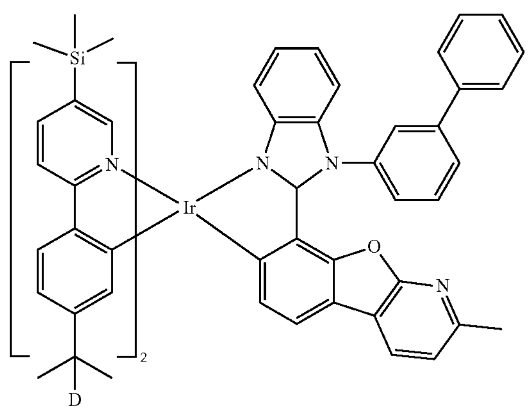

-continued
999
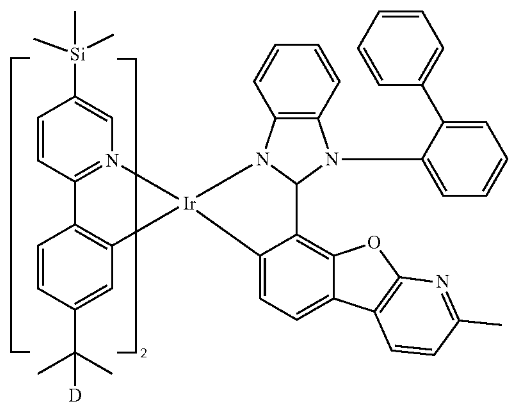
1000
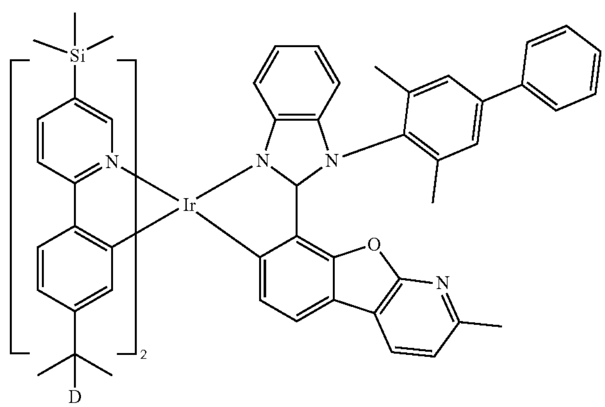
1001
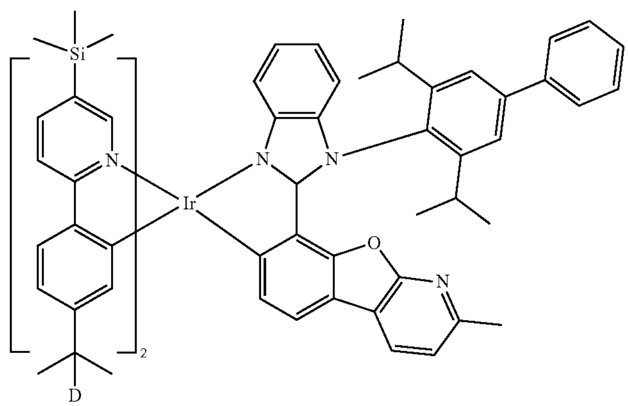
1002
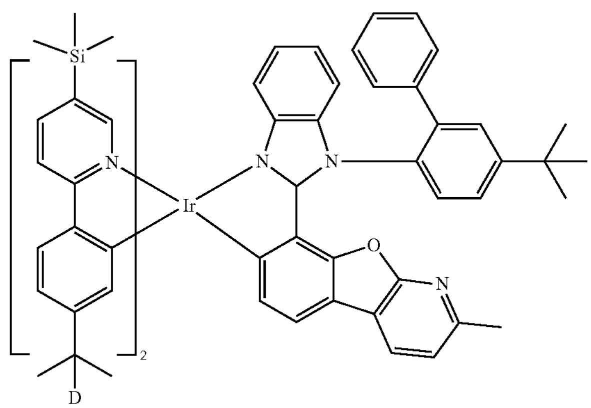

-continued
1003
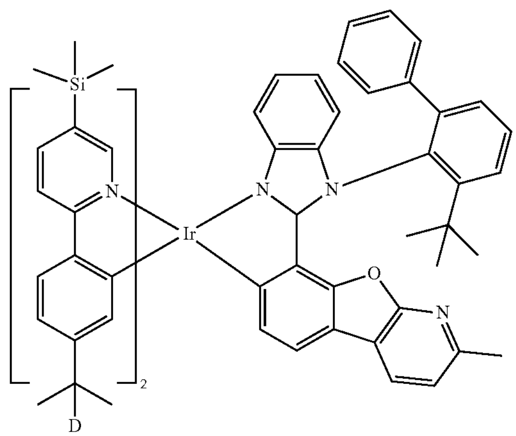
1004
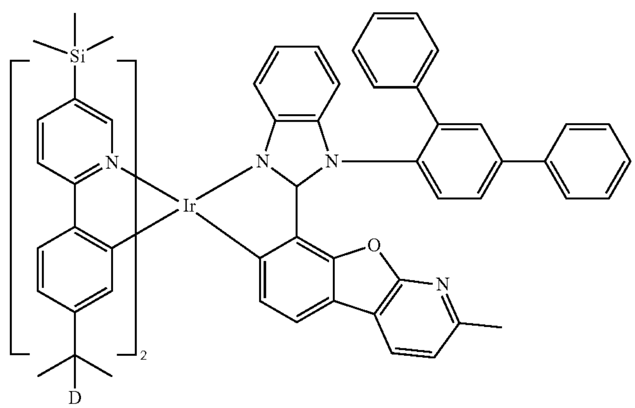
1005
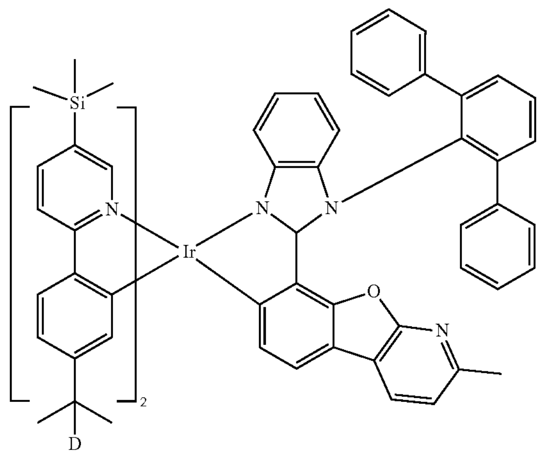

-continued
1006
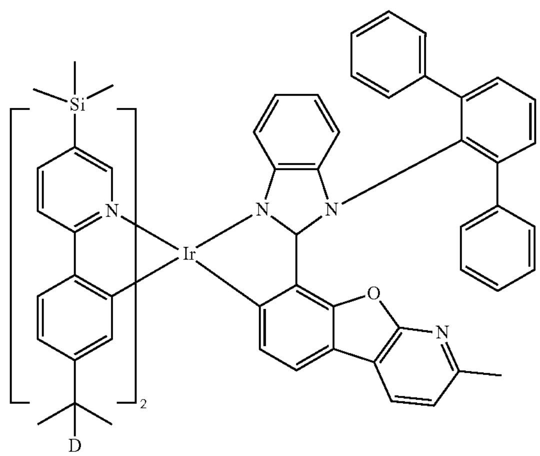
1007
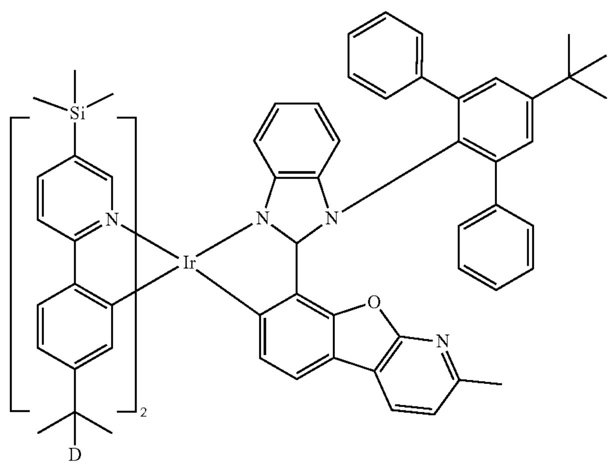
1008
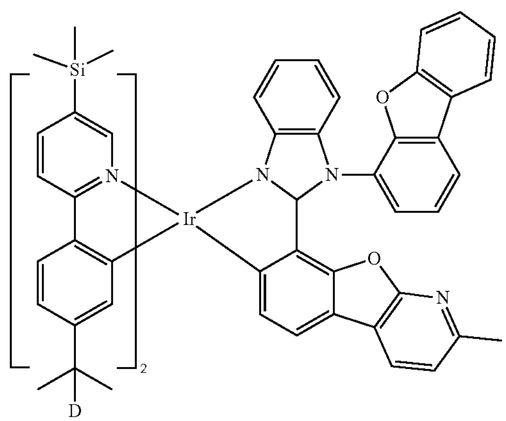

-continued
1009
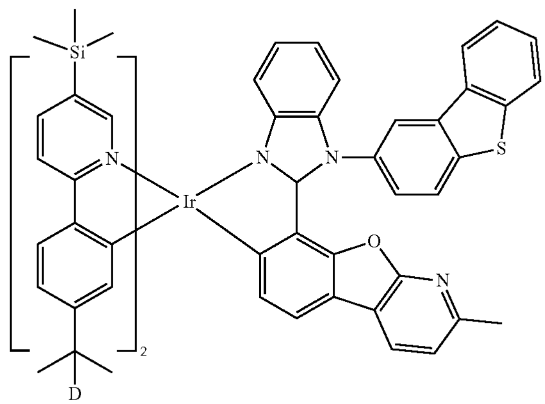
1010
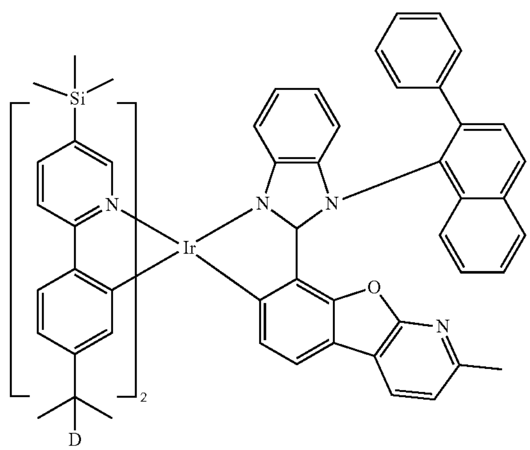
1011
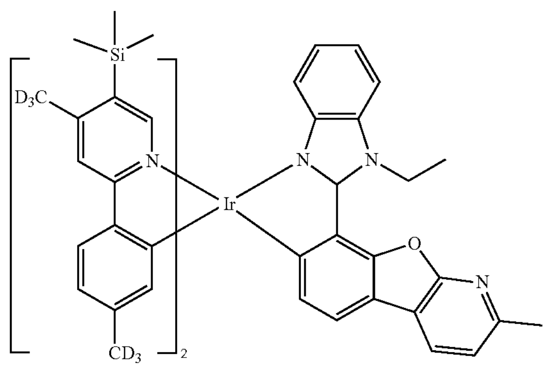
1012
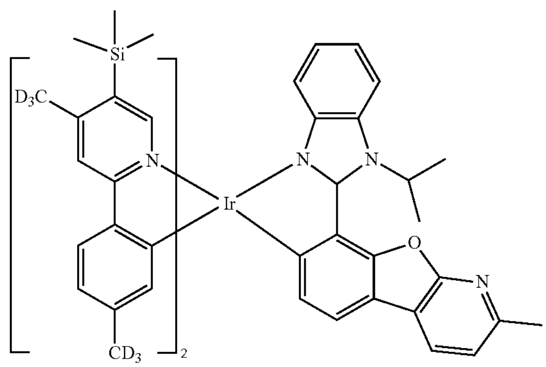

-continued
1013
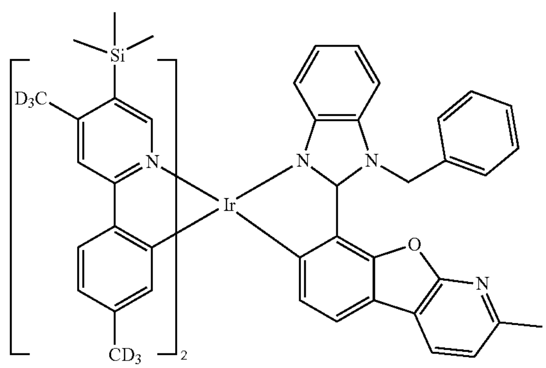
1014
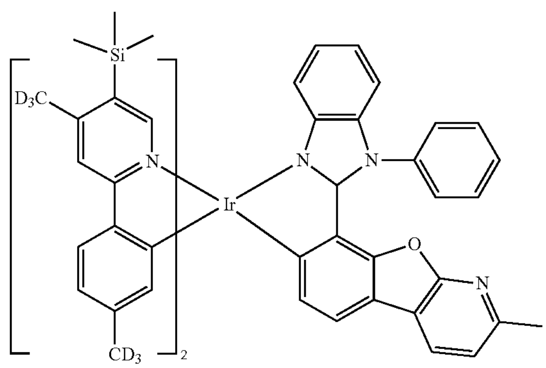
1015
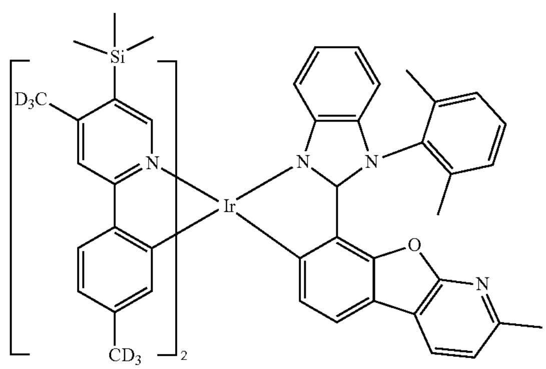
1016
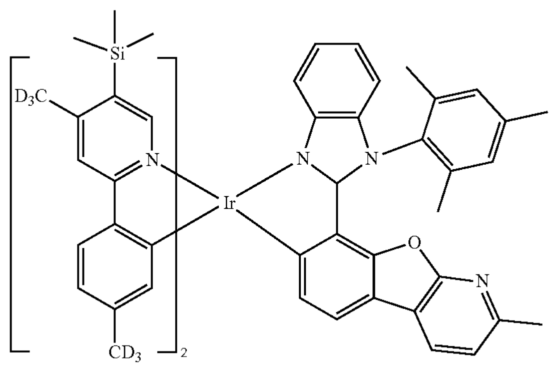

-continued
1017
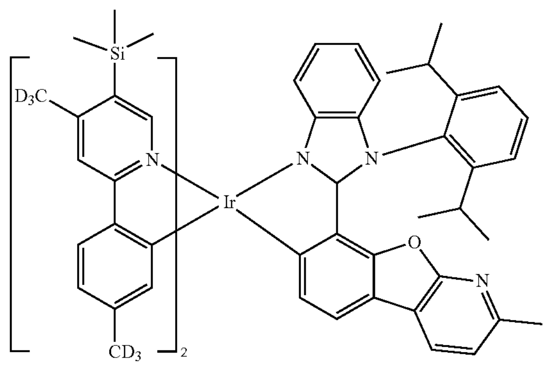
1018
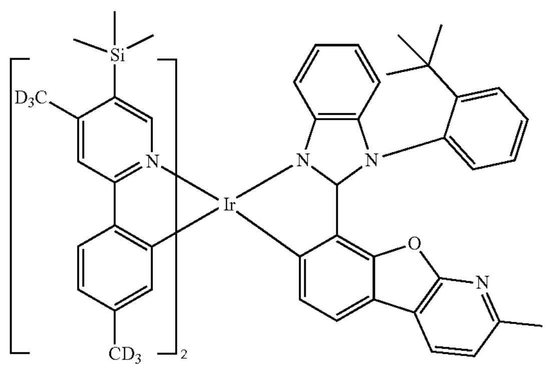
1019
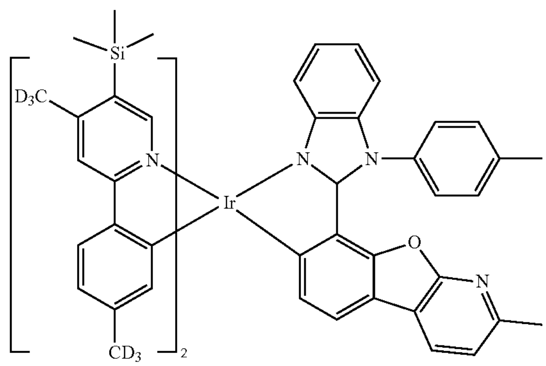
1020
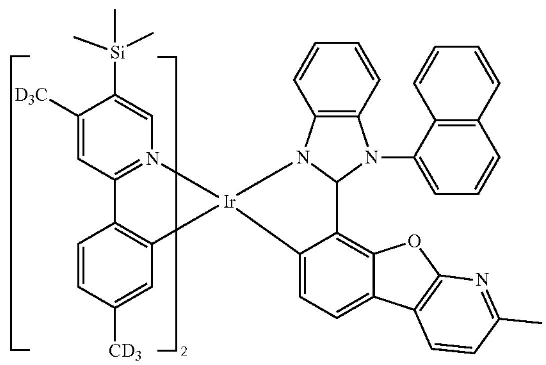

-continued
1021
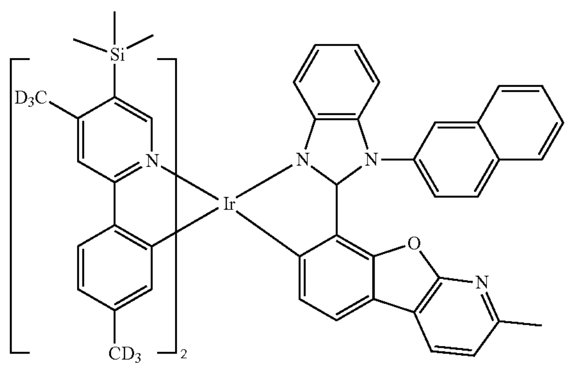
1022
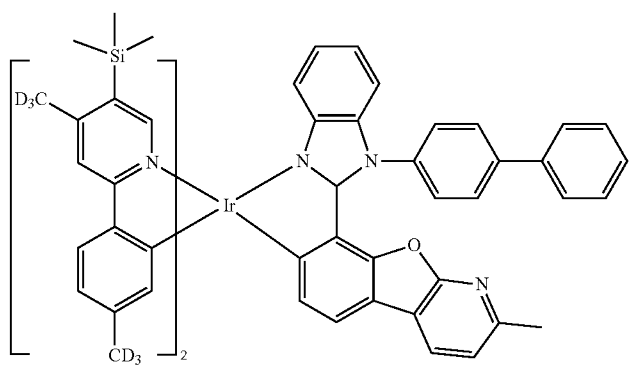
1023
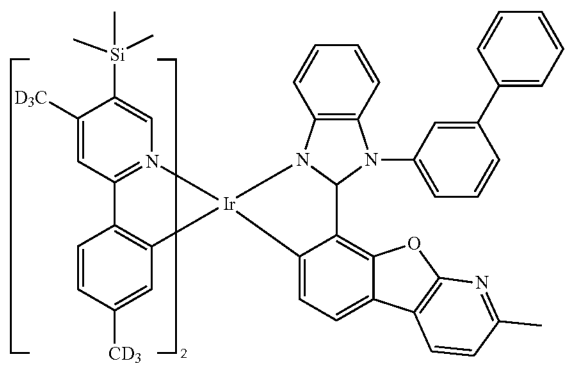
1024
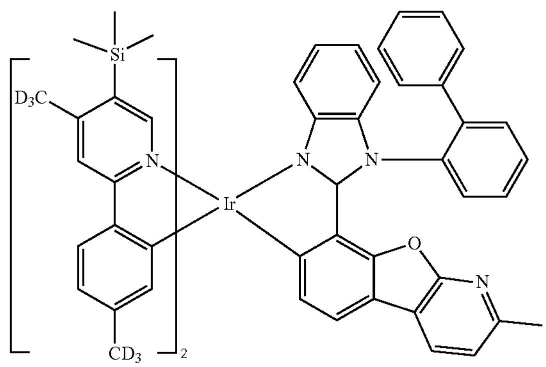

-continued
1025
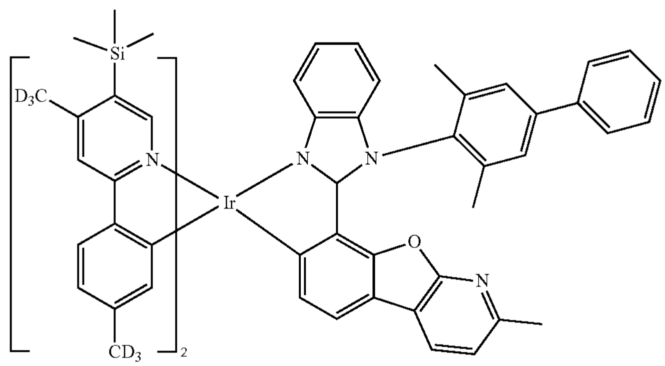
1026
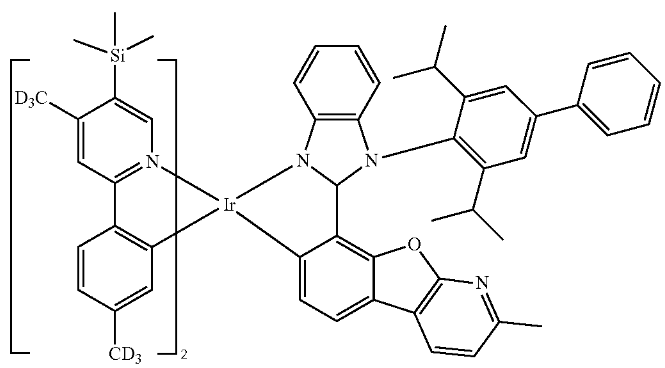
1027
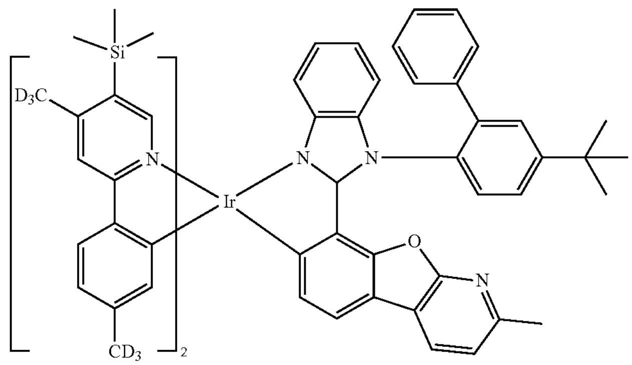
1028
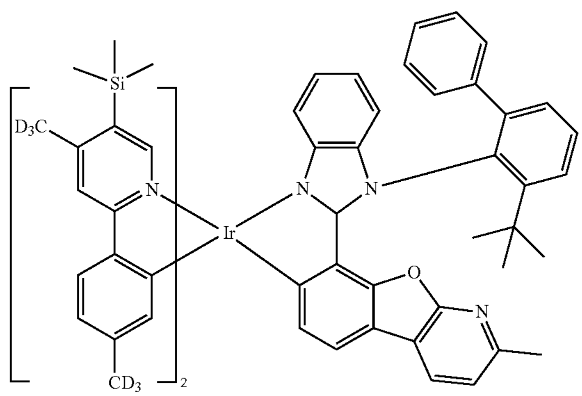

-continued
1029
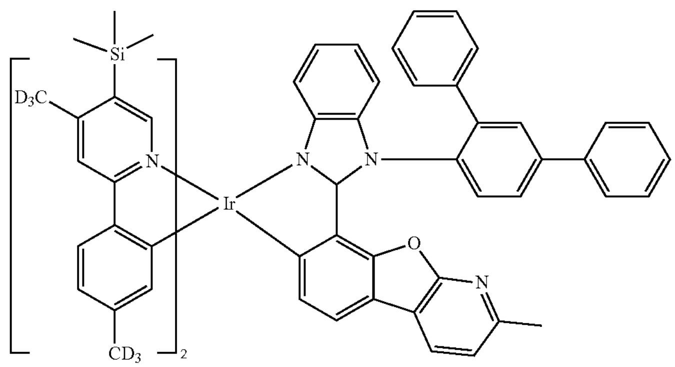
1030
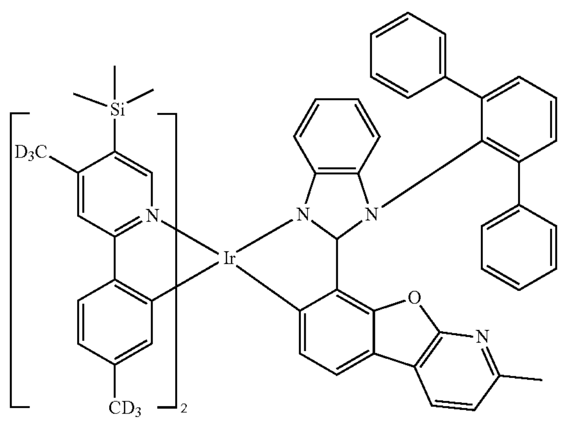
1031
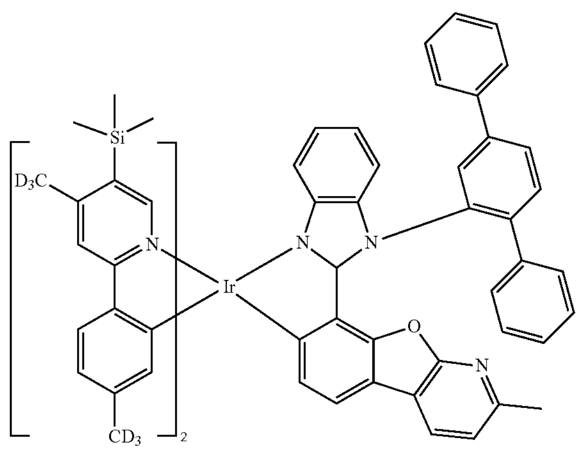

-continued
1032
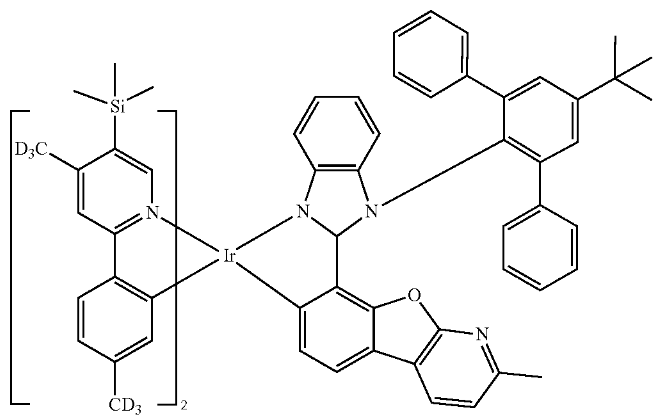
1033
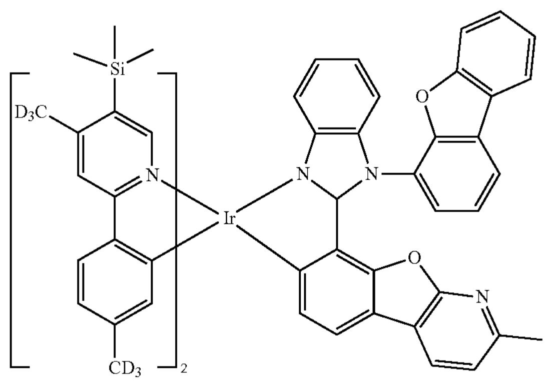
1034
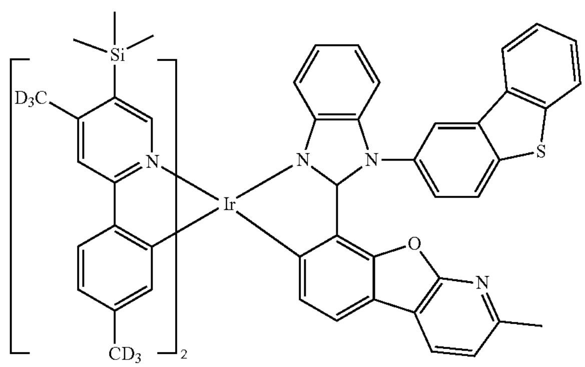
1035
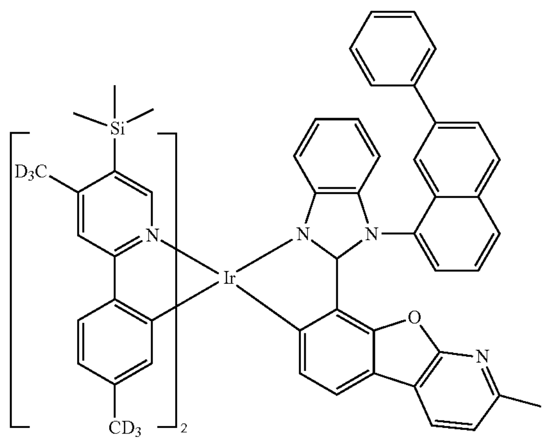

-continued
1036
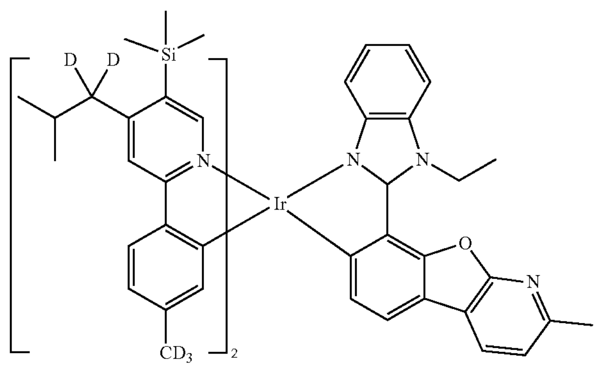
1037
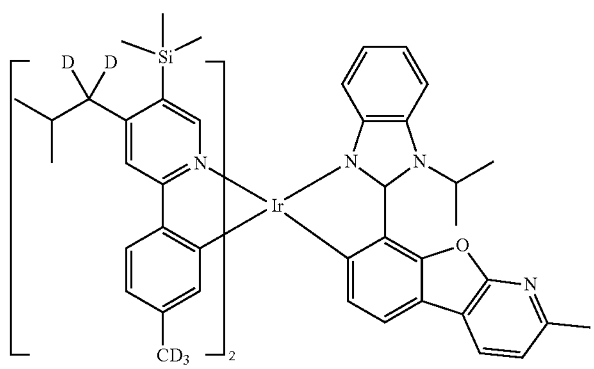
1038
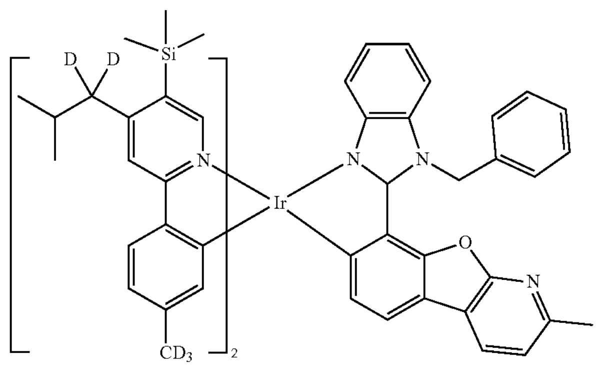
1039
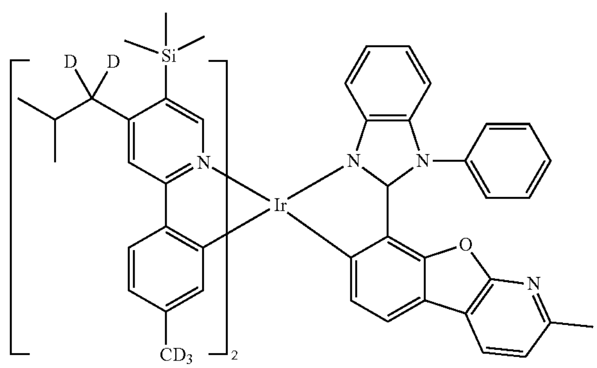

-continued
1040
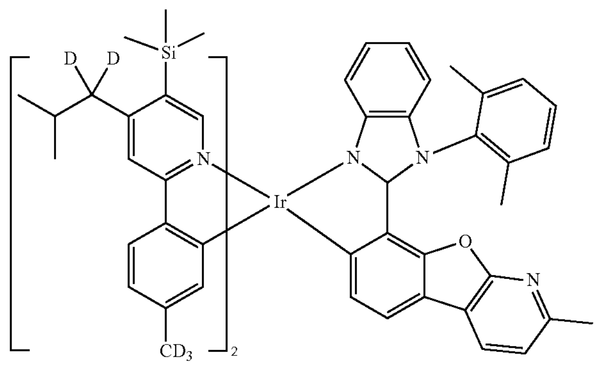
1041
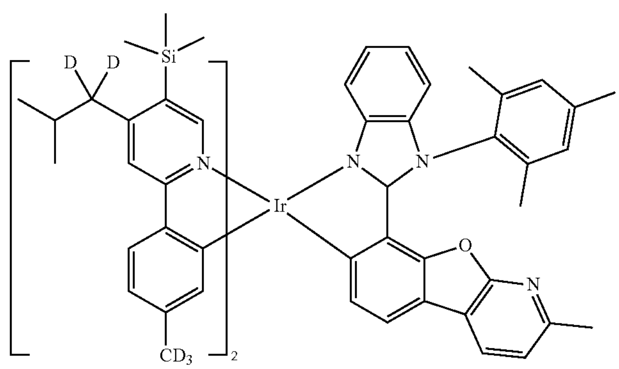
1042
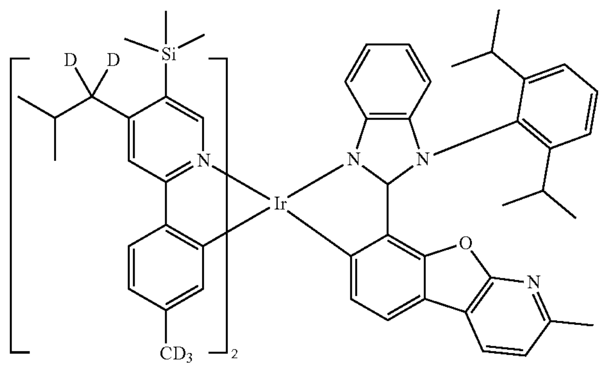
1043
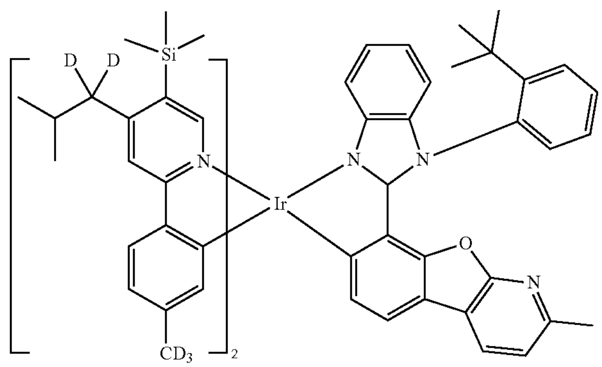

-continued
1044
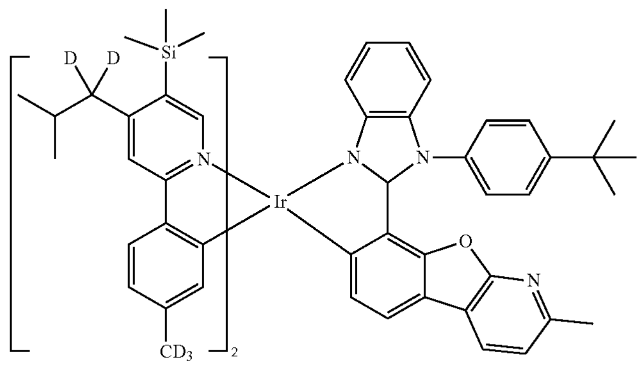
1045
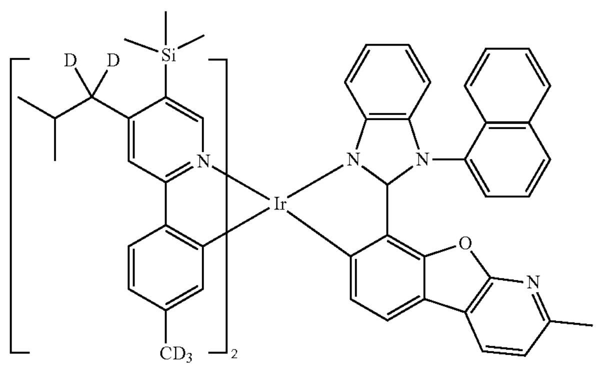
1046
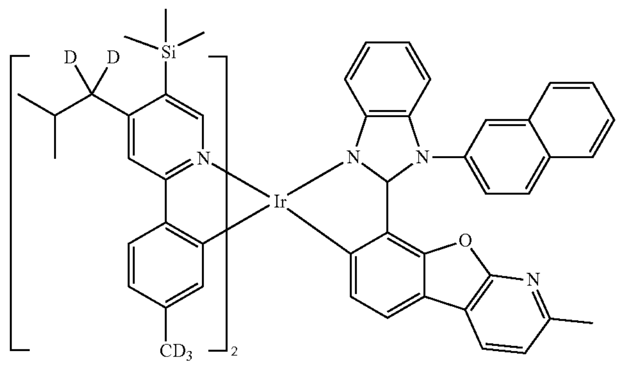
1047
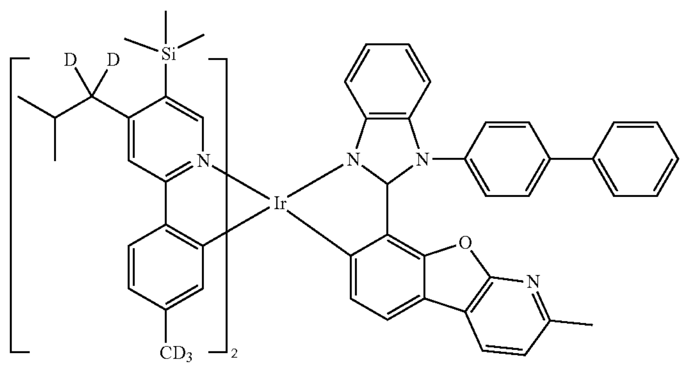

-continued
1048
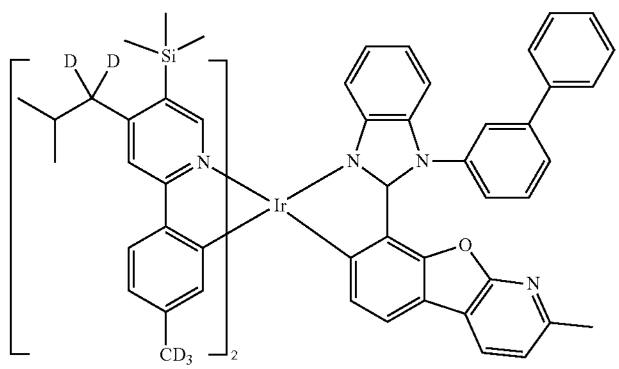
1049
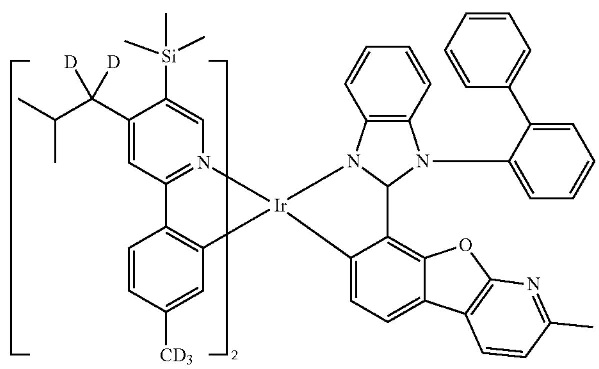
1050
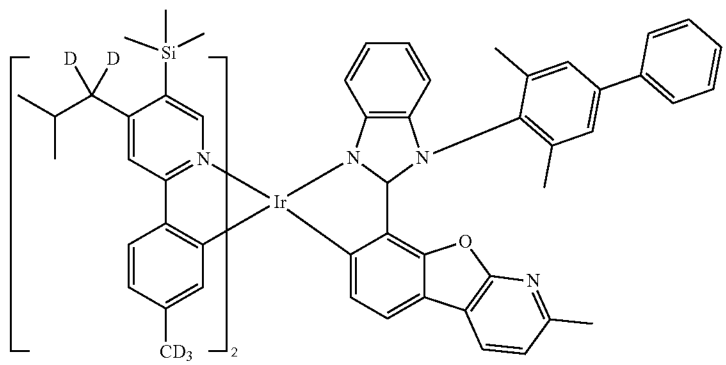
1051
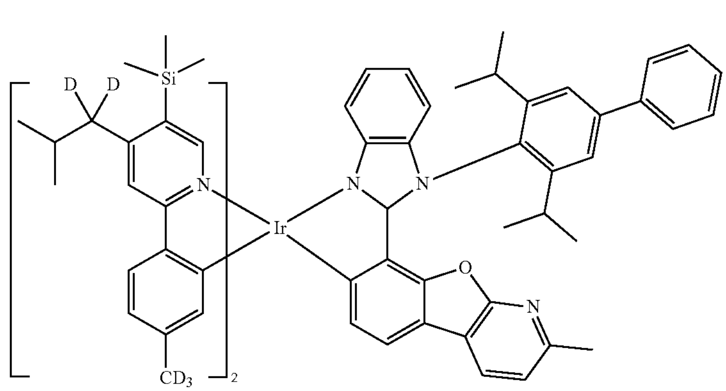

-continued
1052
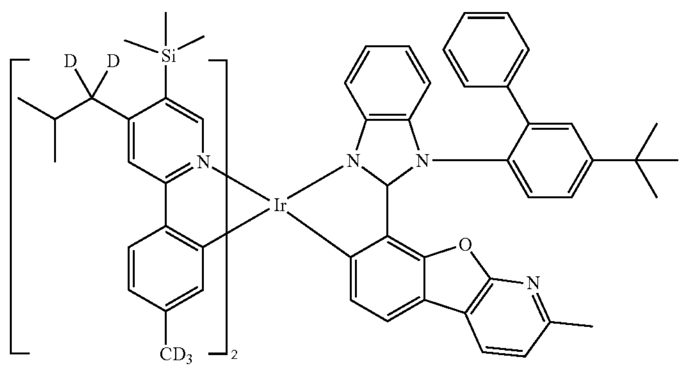
1053
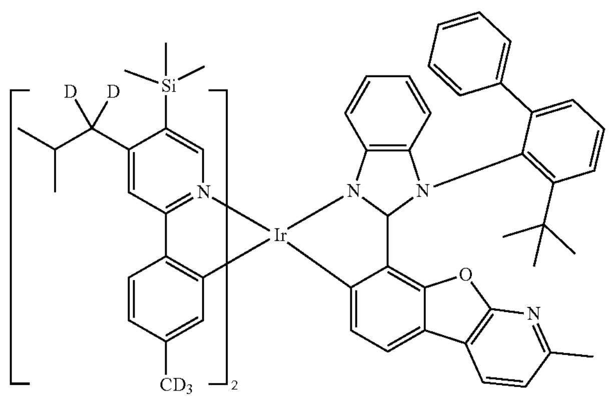
1054
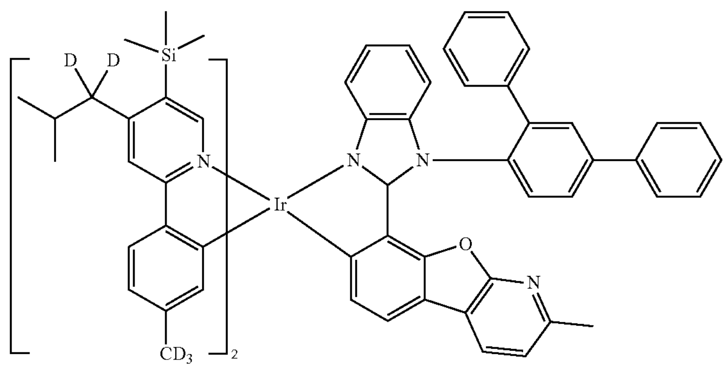
1055
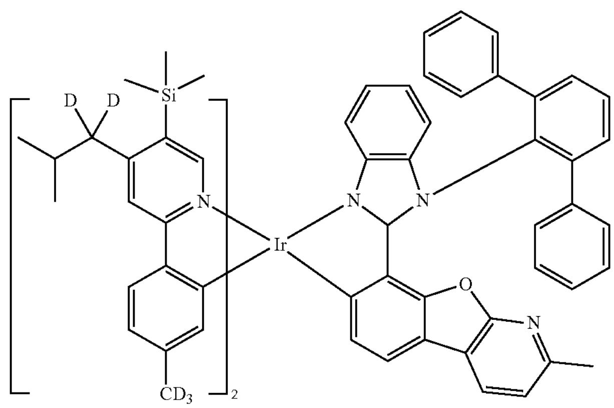

-continued
1056
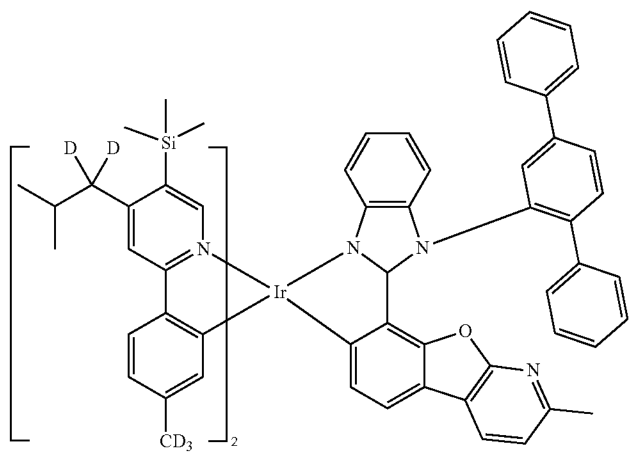
1057
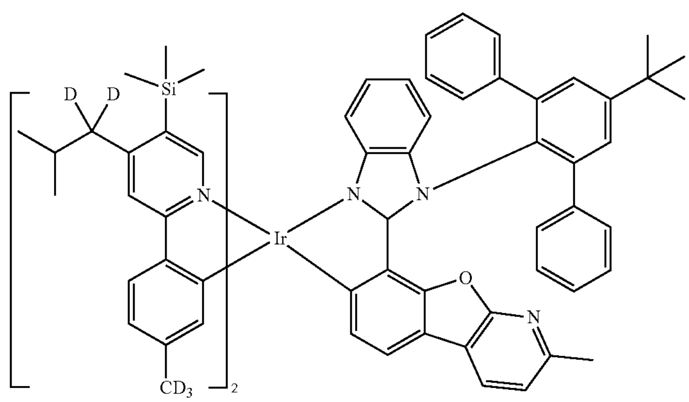
1058
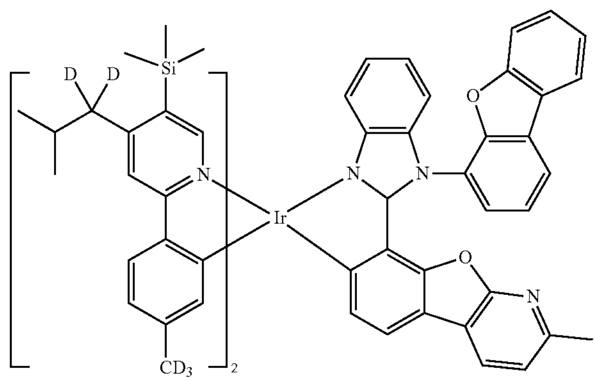
1059
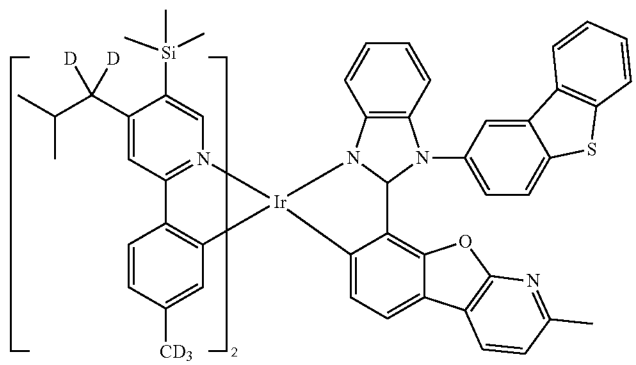

-continued
1060
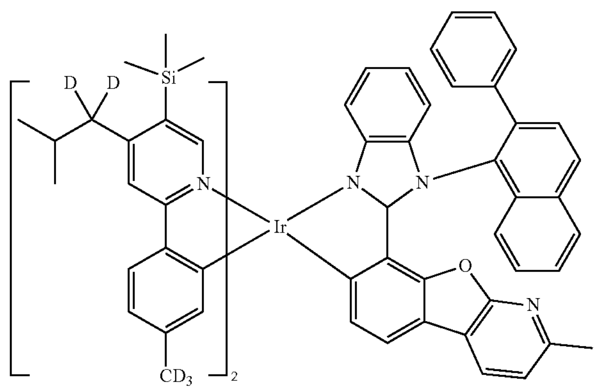
1061
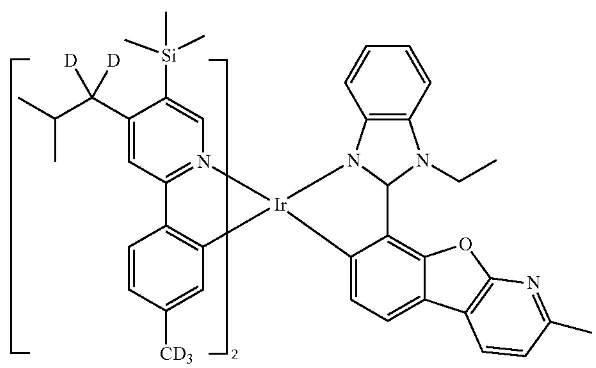
1062
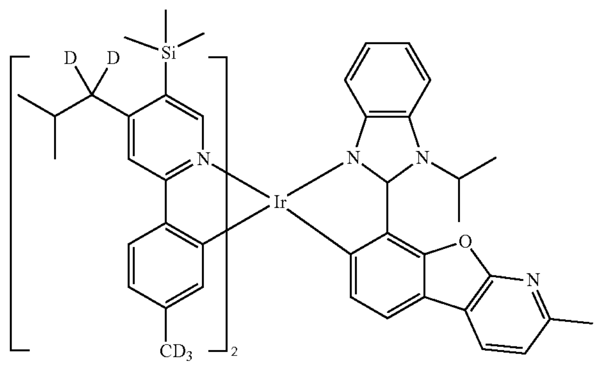
1063
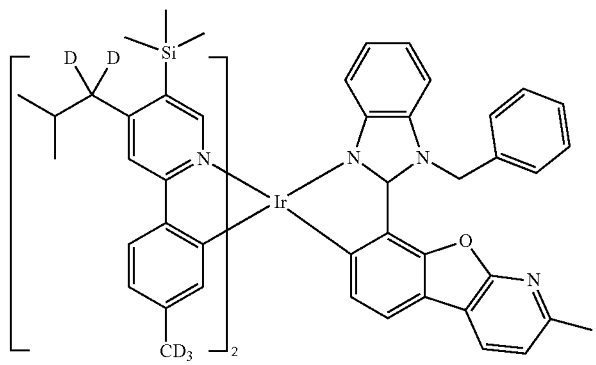

-continued
1064
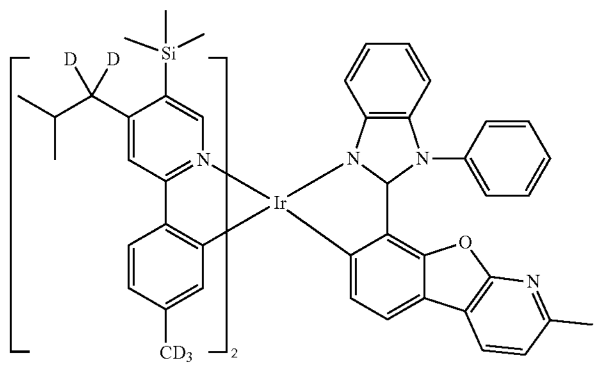
1065
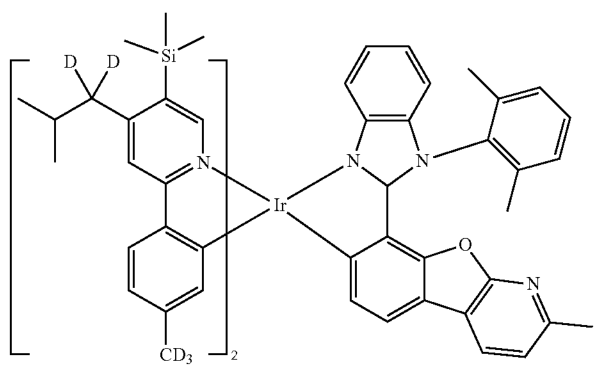
1066
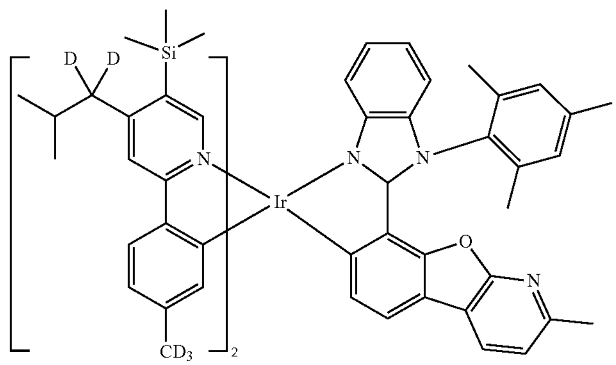
1067
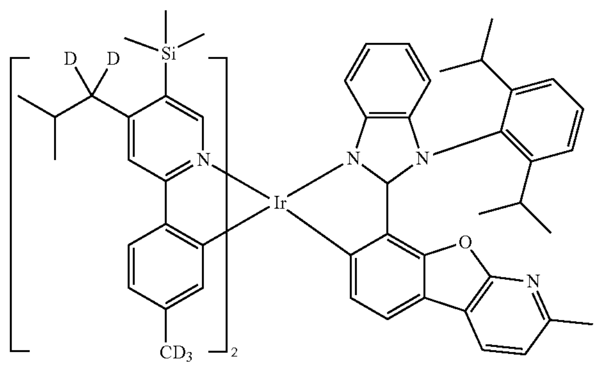

-continued
1068
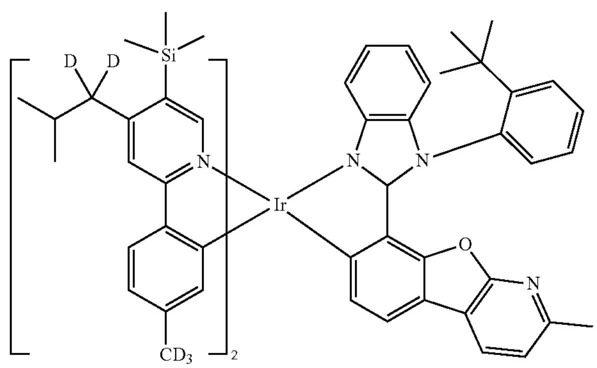
1069
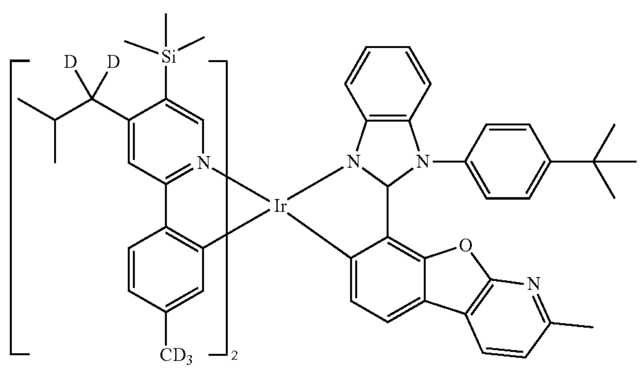
1070
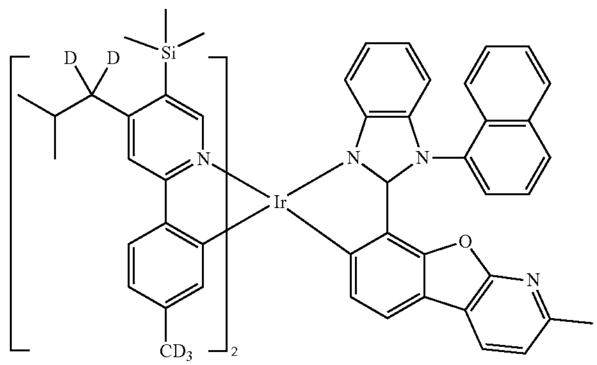
1071
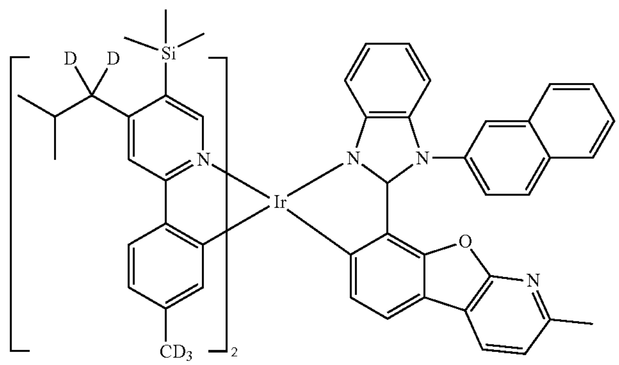

-continued
1072
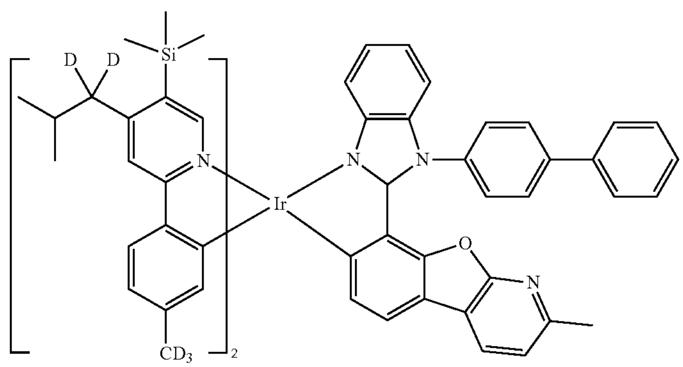
1073
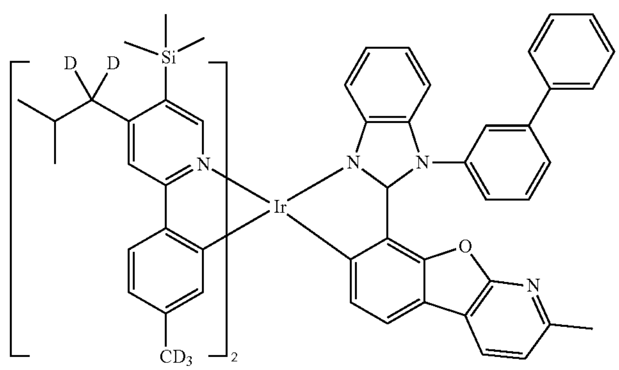
1074
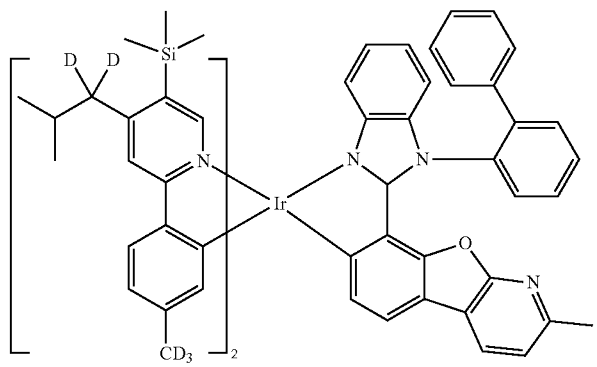
1075
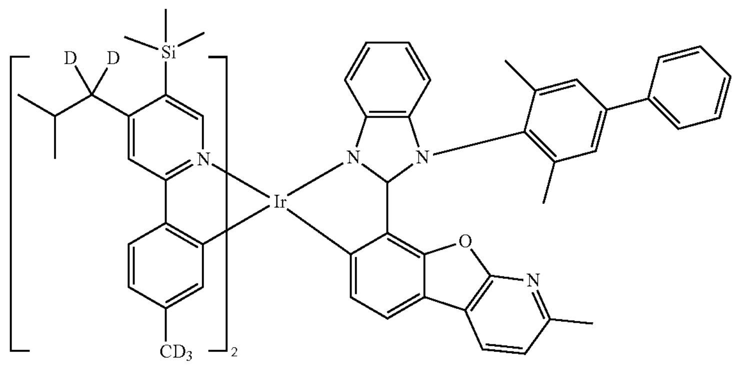

-continued
1076
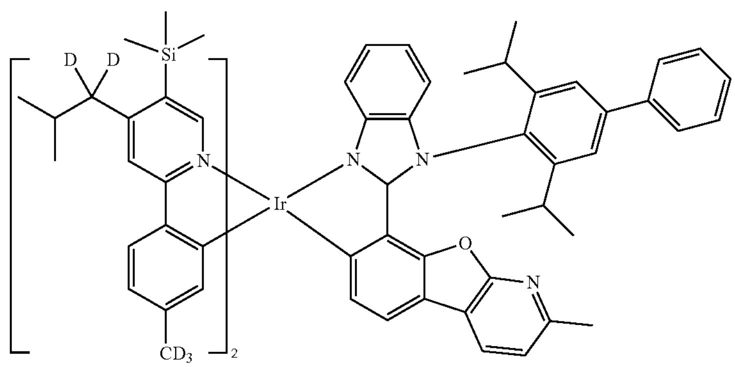
1077
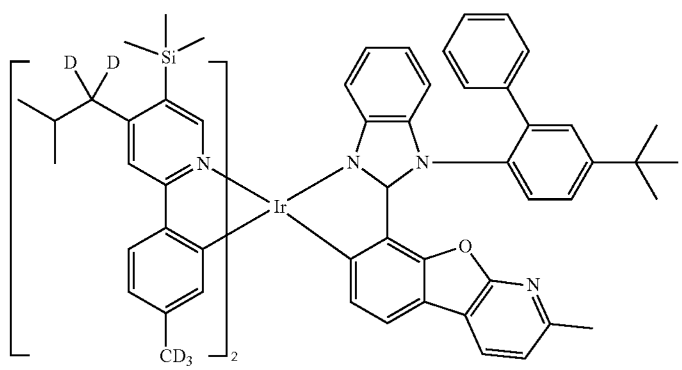
1078
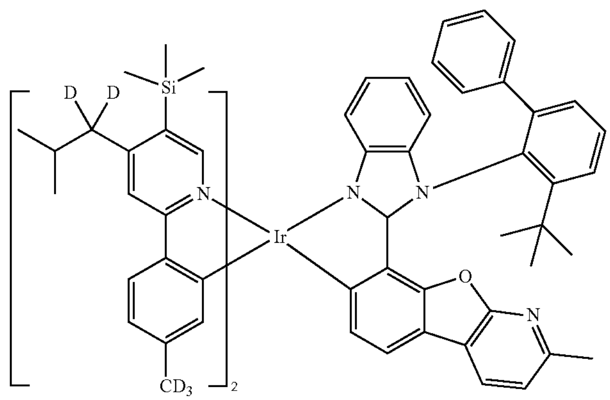
1079
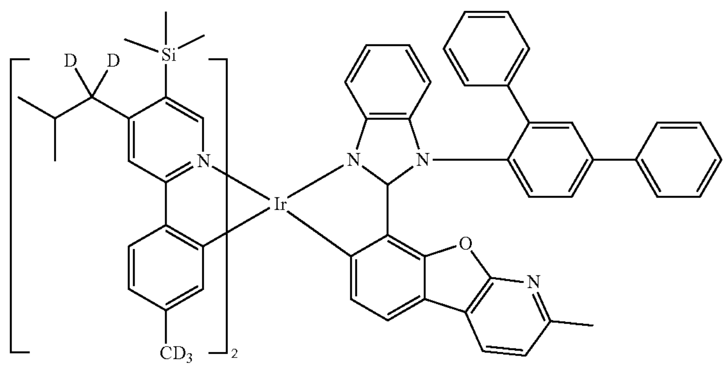

-continued
1080
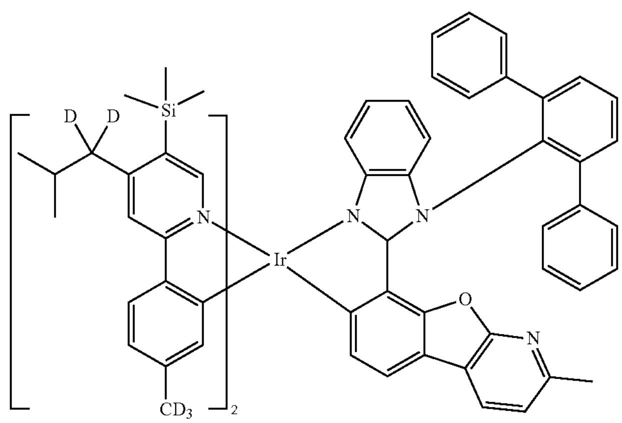
1081
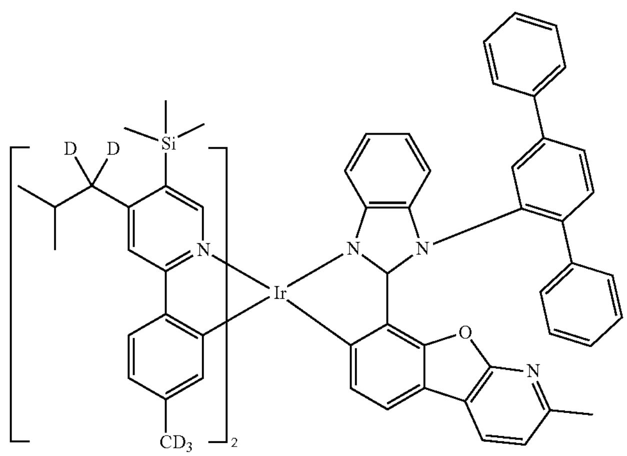
1082
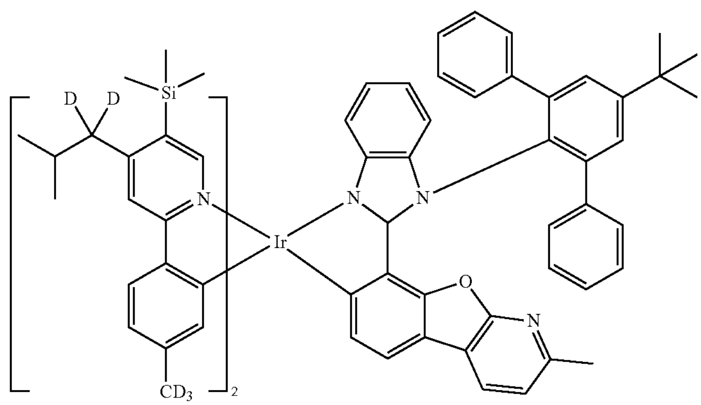
1083
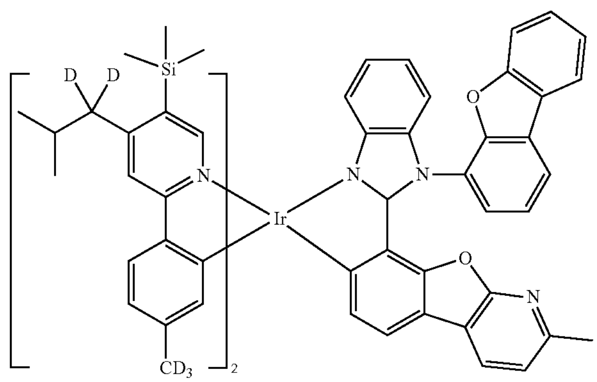

-continued
1084
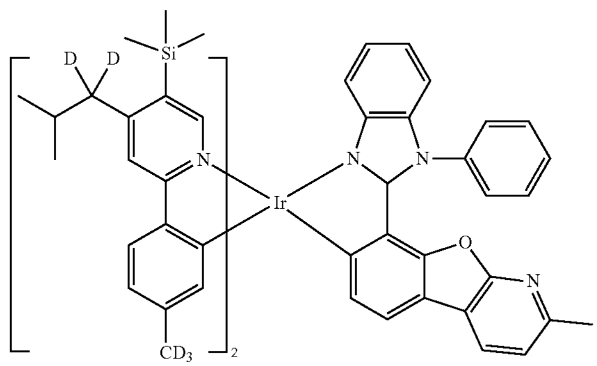
1085
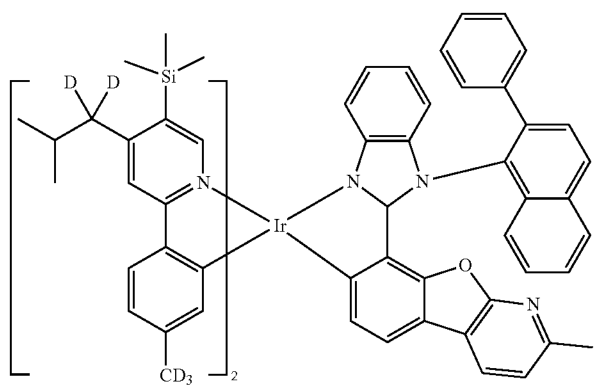
1086
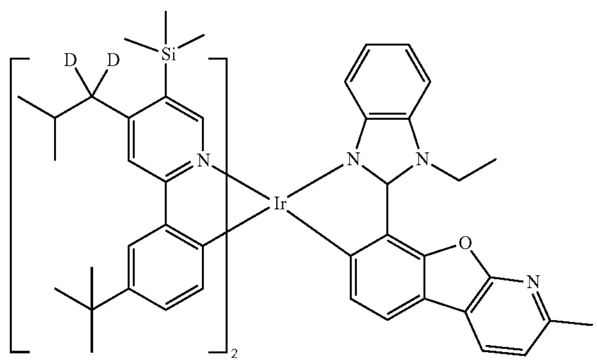
1087
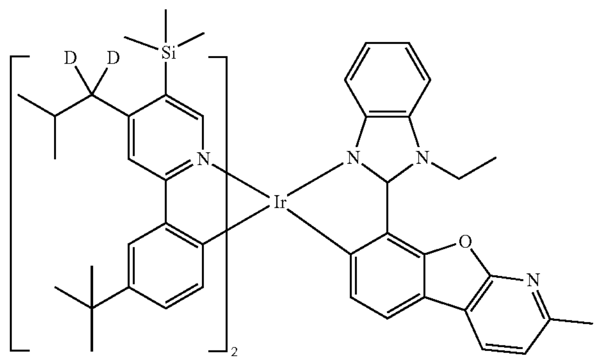

-continued
1088
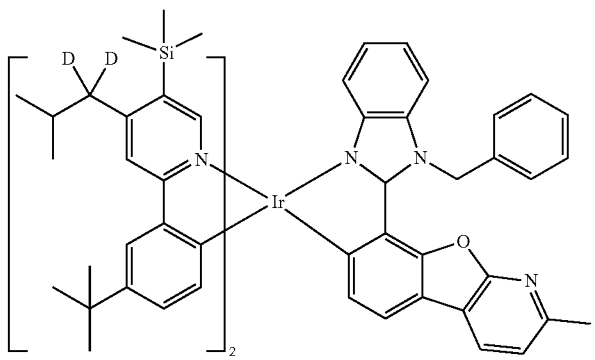
1089
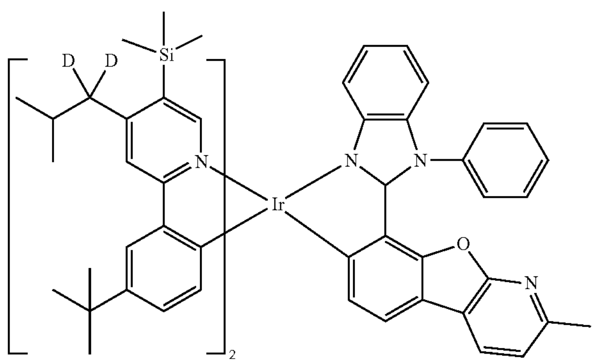
1090
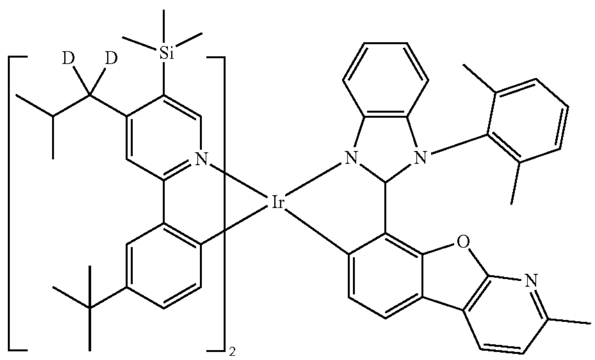
1091
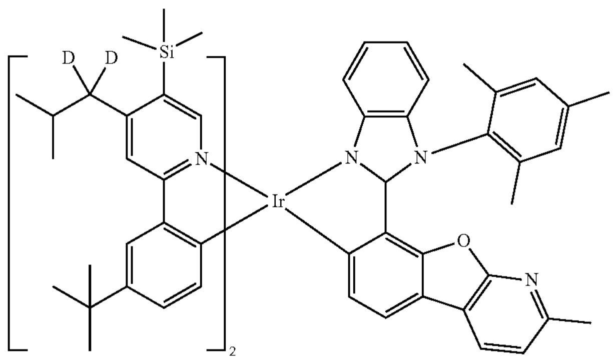

-continued
1091
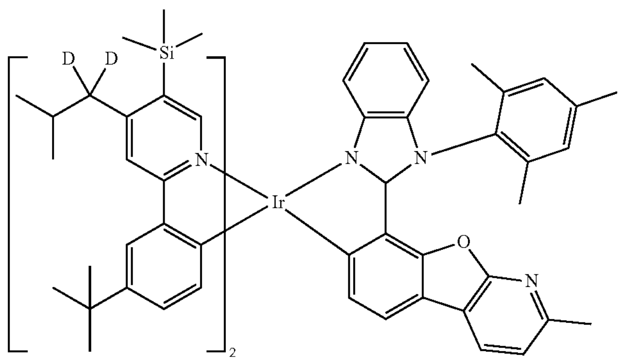
1092
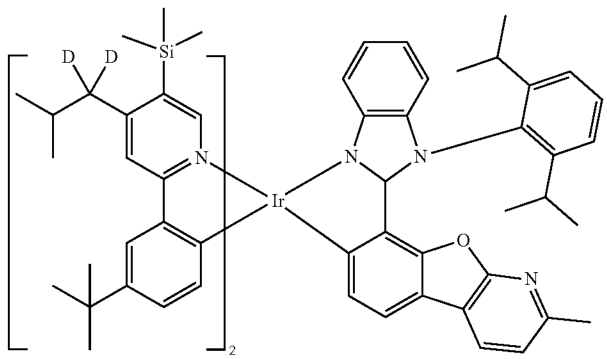
1093
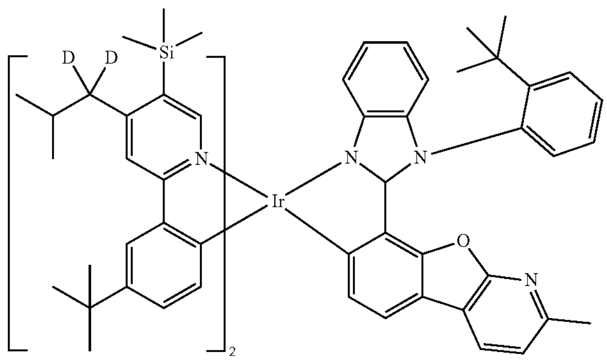
1094
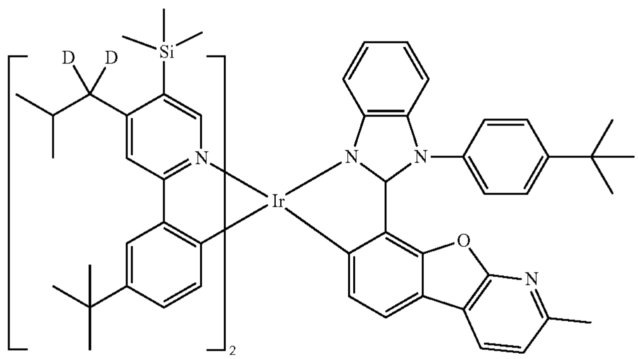

-continued
1095
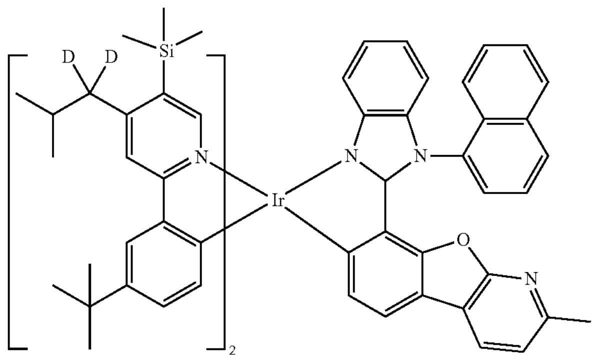
1096
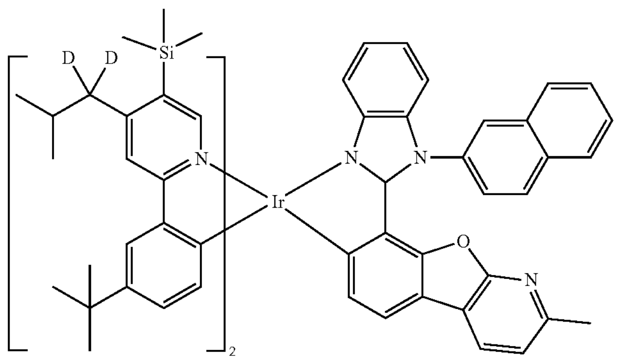
1097
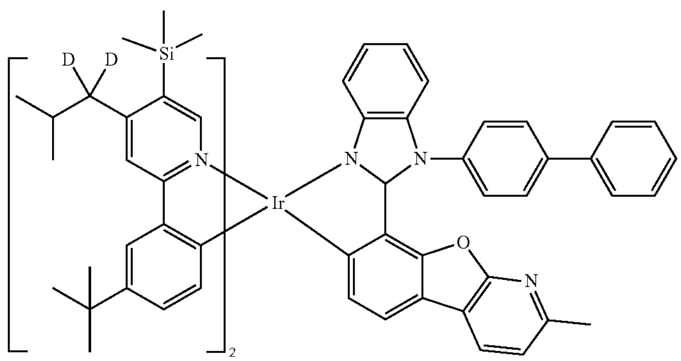
1098
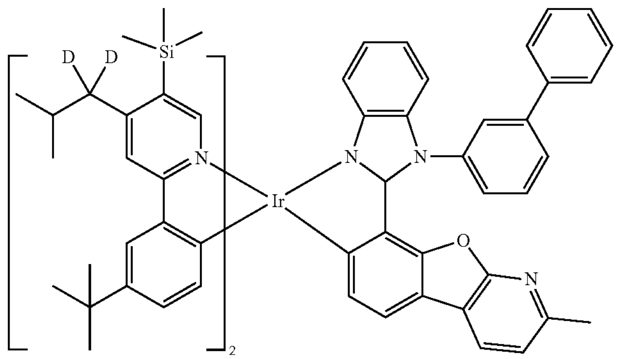

-continued
1099
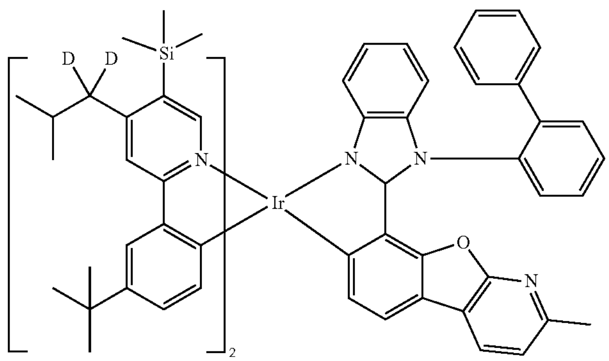
1100
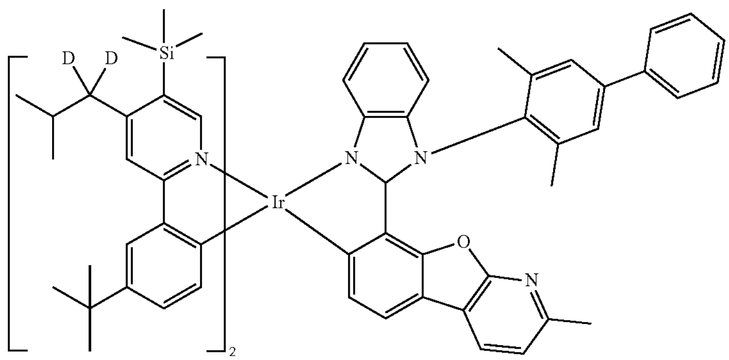
1101
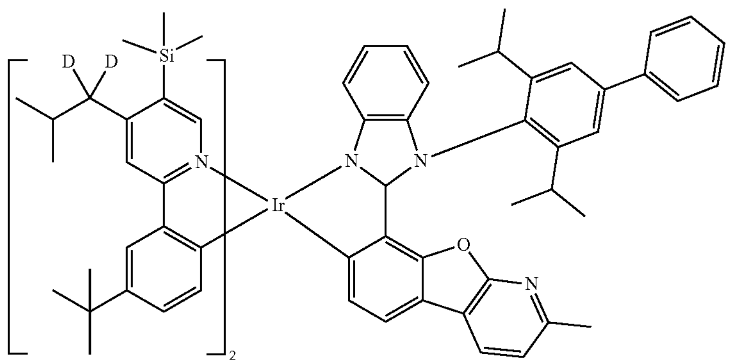
1102
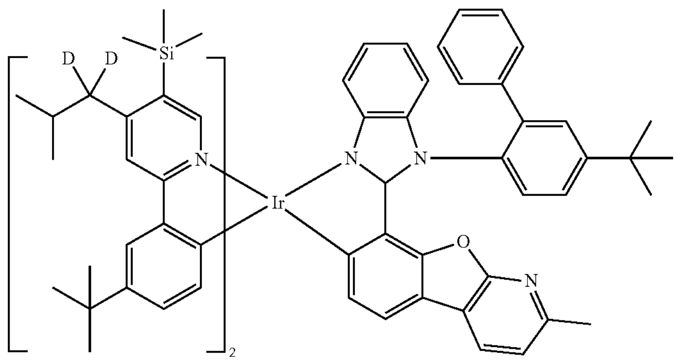

-continued
1103
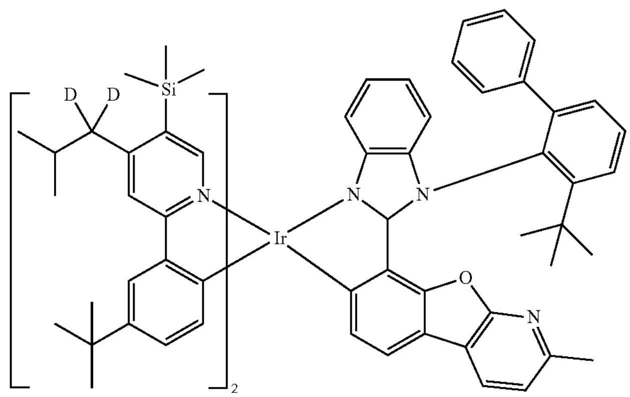
1104
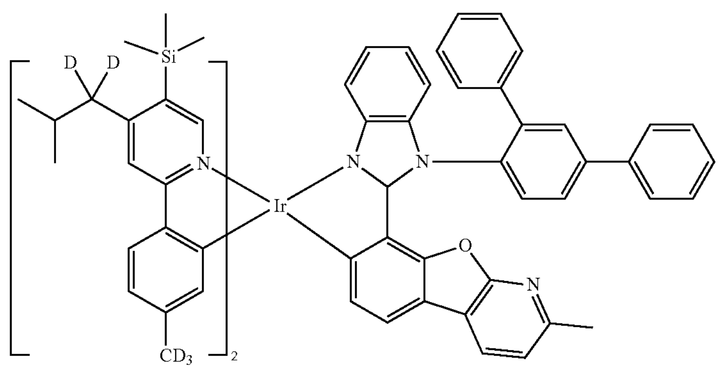
1105
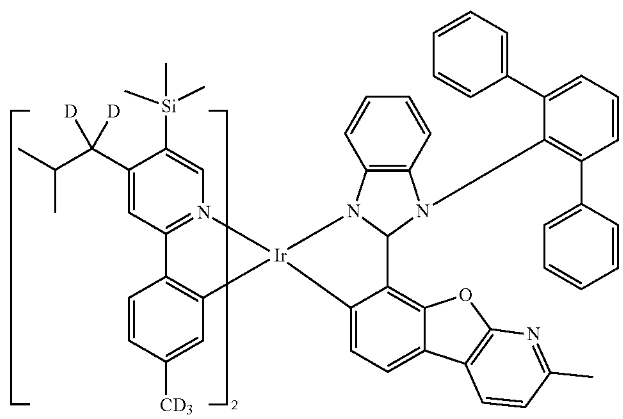
1106
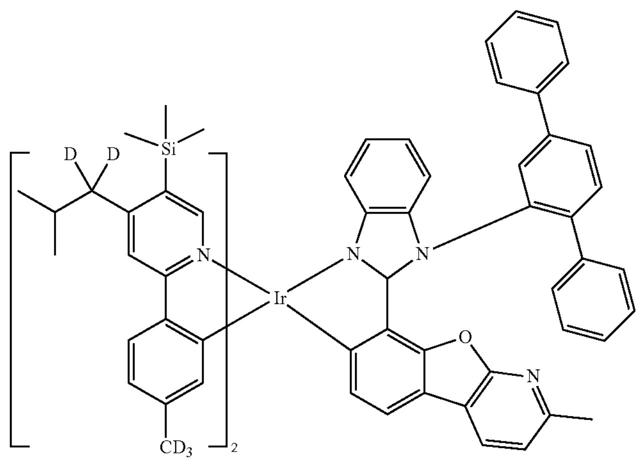

-continued
1107
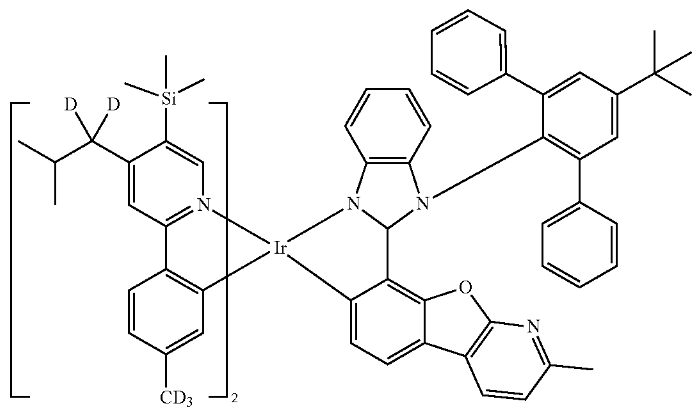
1108
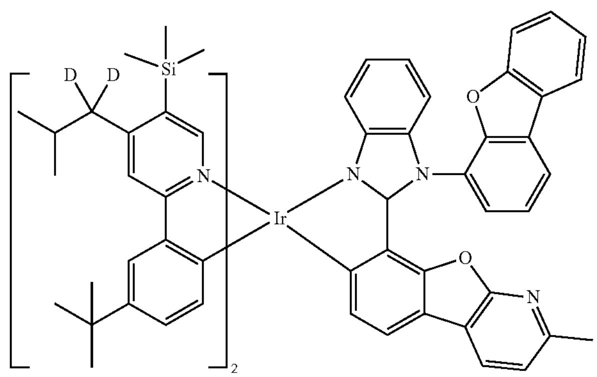
1109
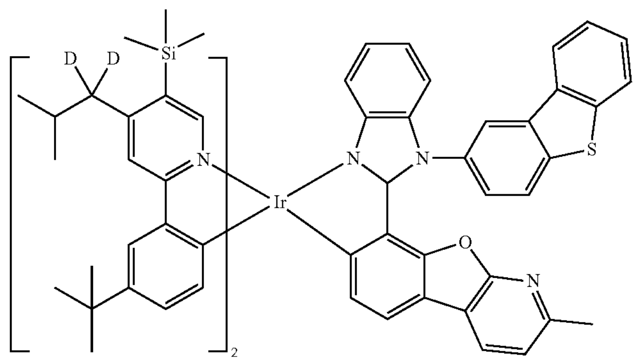
1110
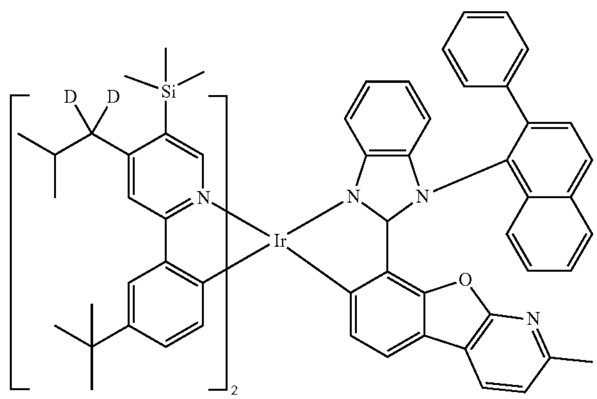

-continued
1111
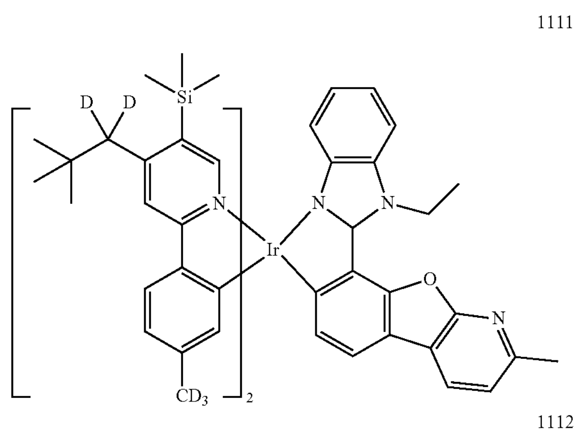
1112
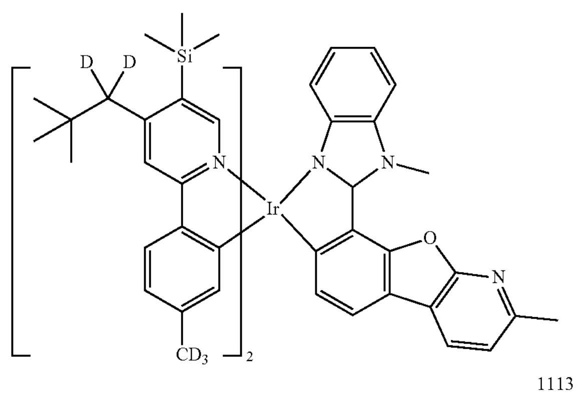
1113
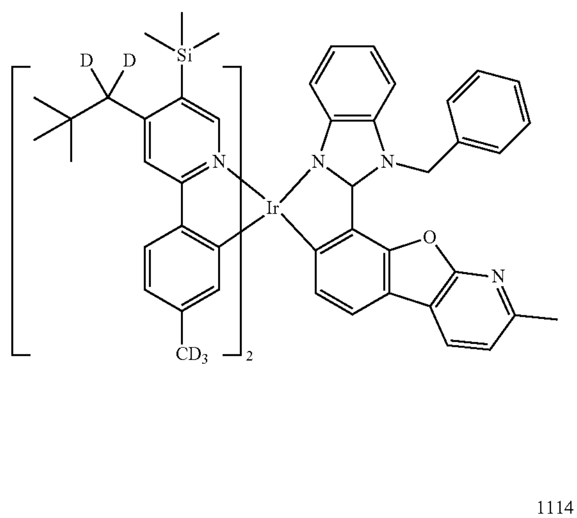
1114
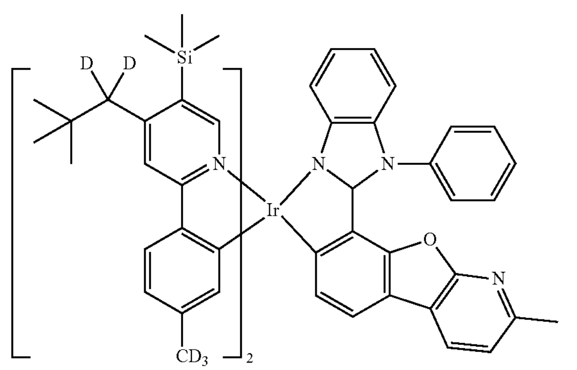
1115
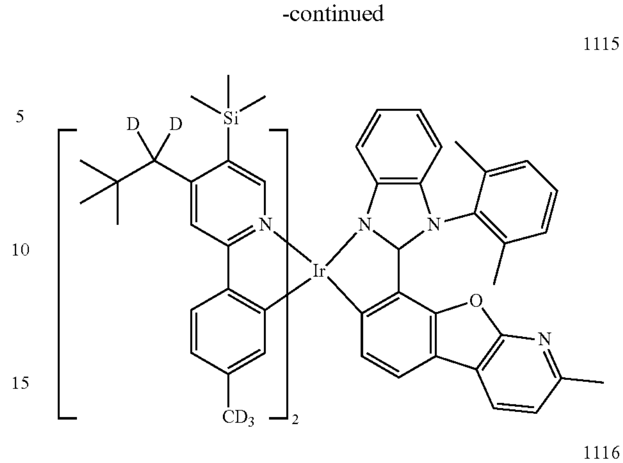
1116
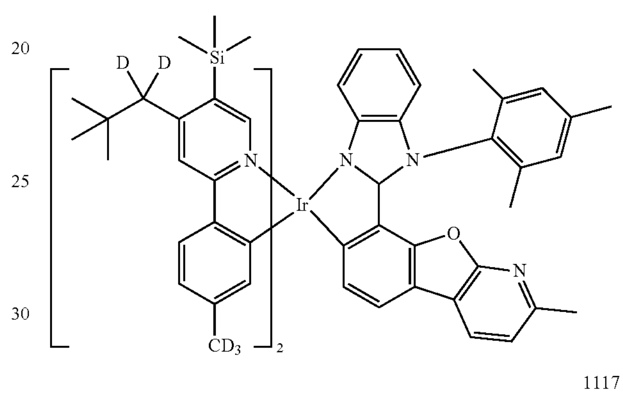
1117
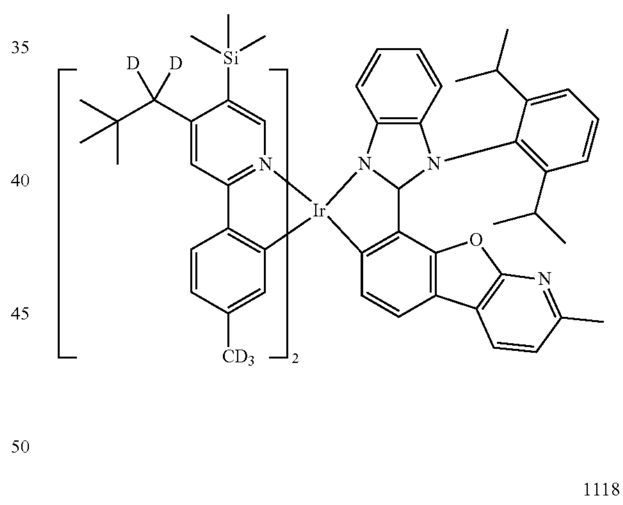
1118
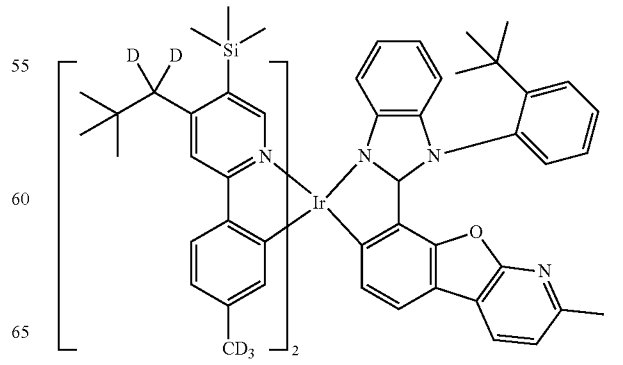

-continued
1119
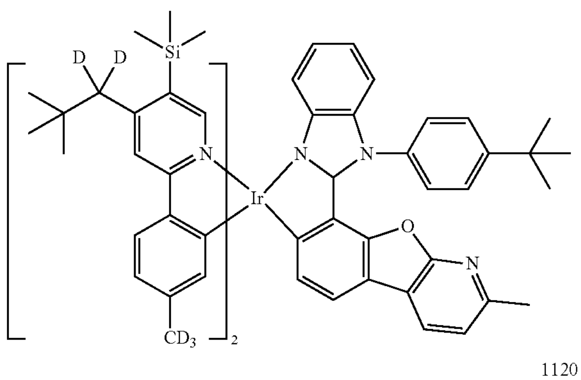
1120
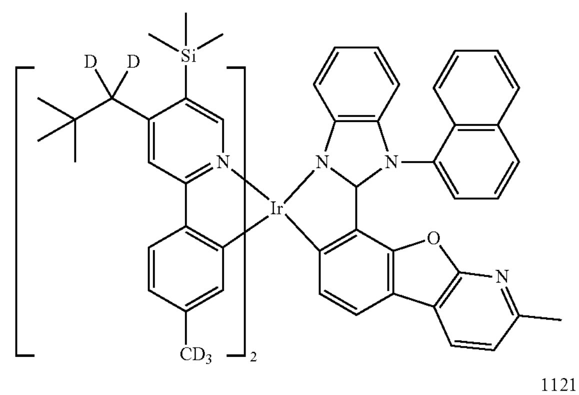
1121
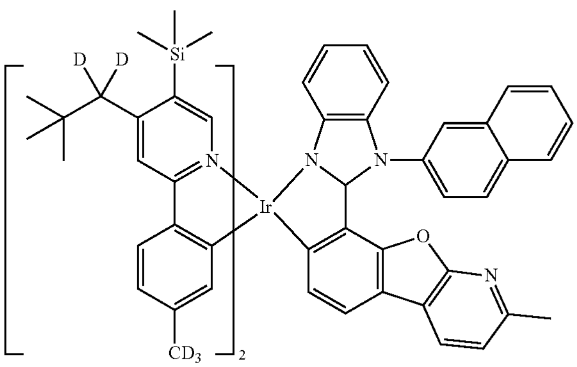
1122
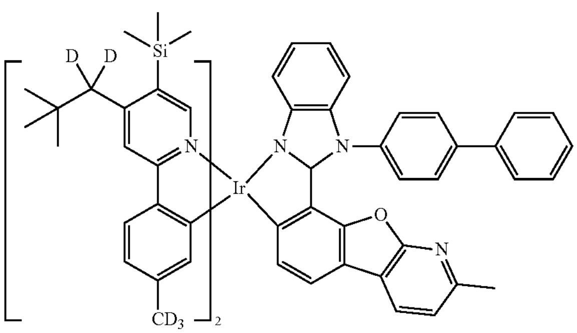
-continued
1123
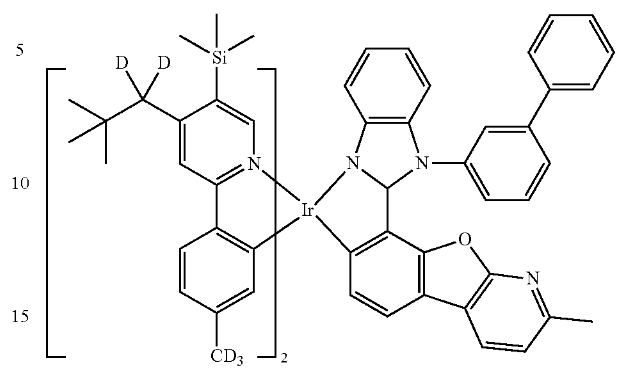
1124
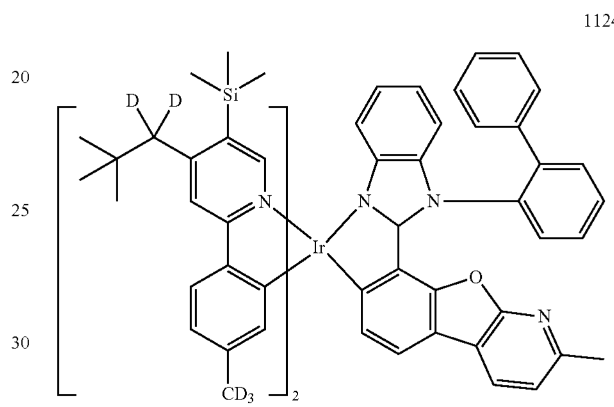
1125
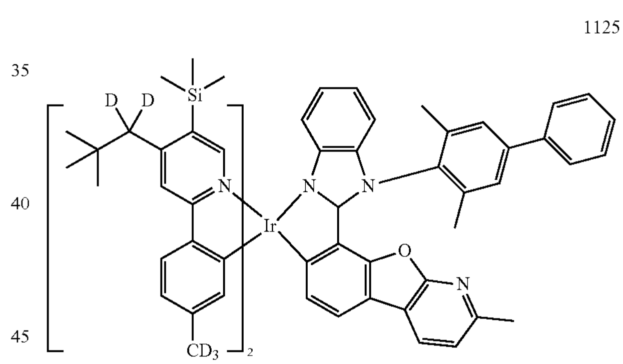
1126
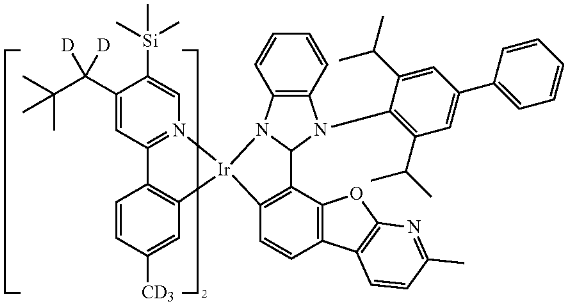

-continued
1127
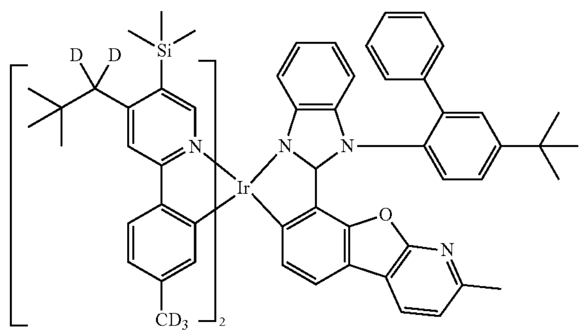
1128
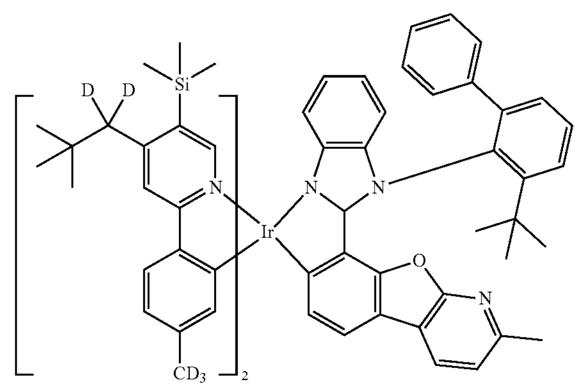
1129
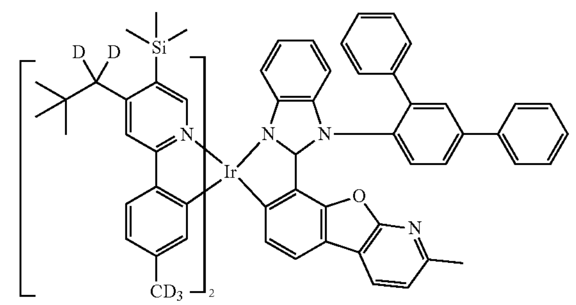
1130
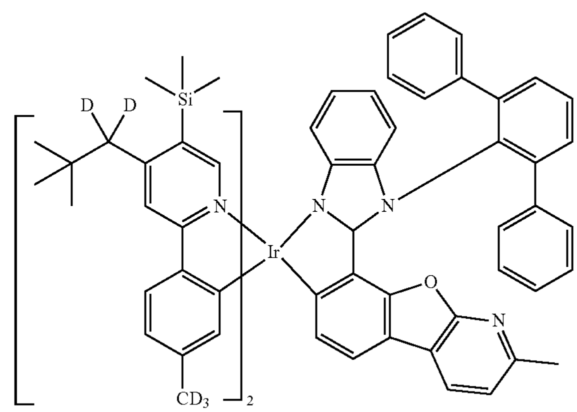
-continued
1131
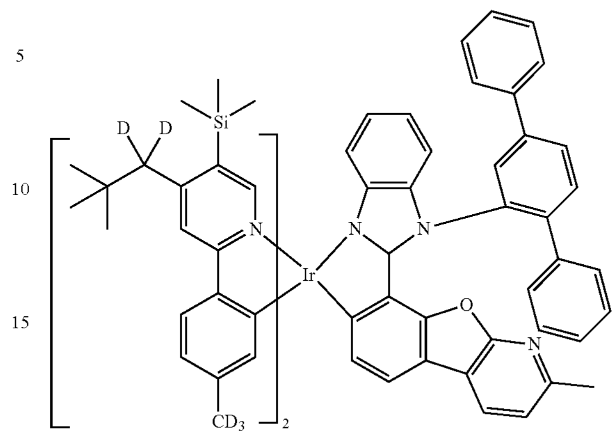
1132
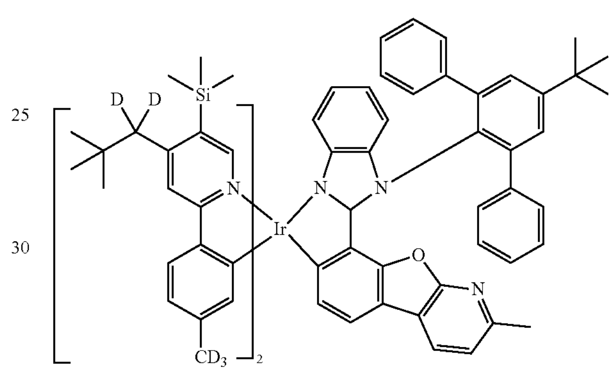
1133
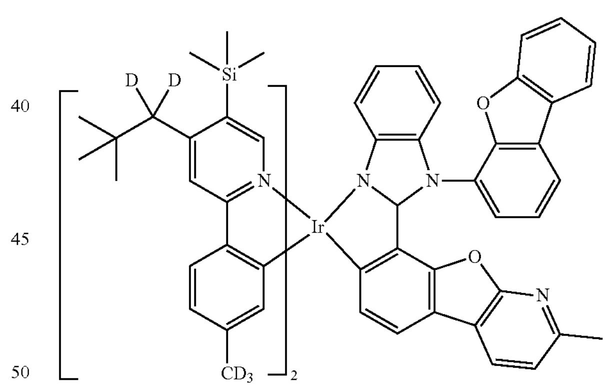
1134
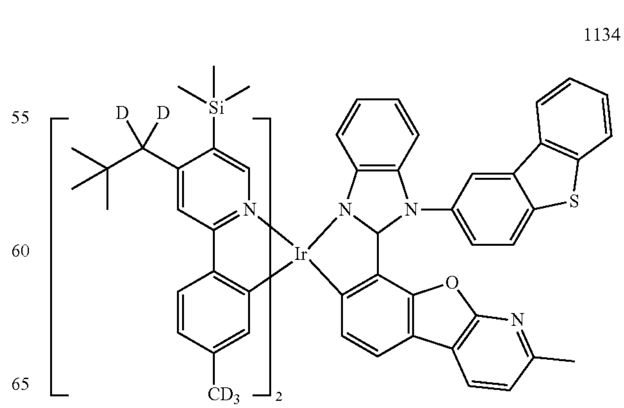

1135
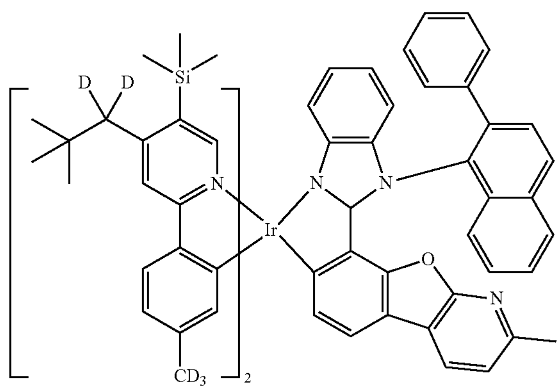
1136
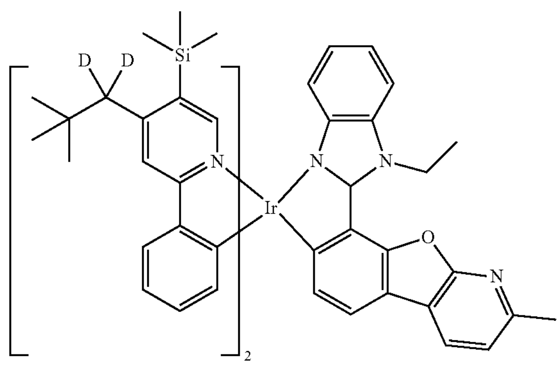
1137
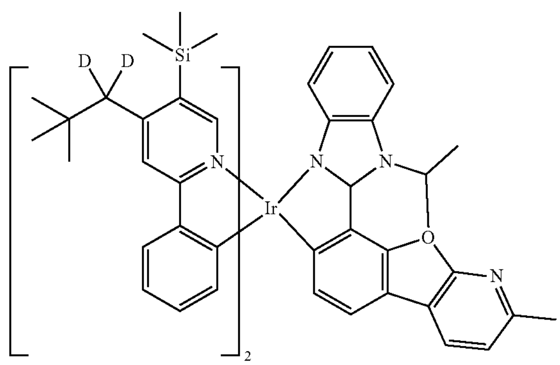
1138
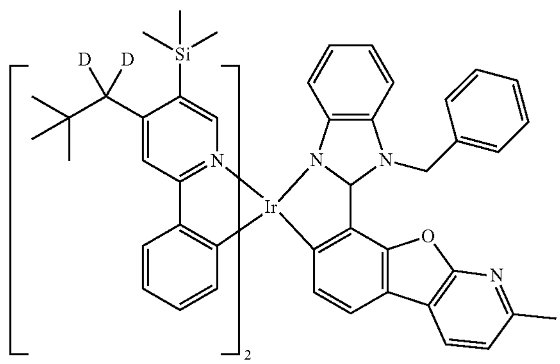
1139
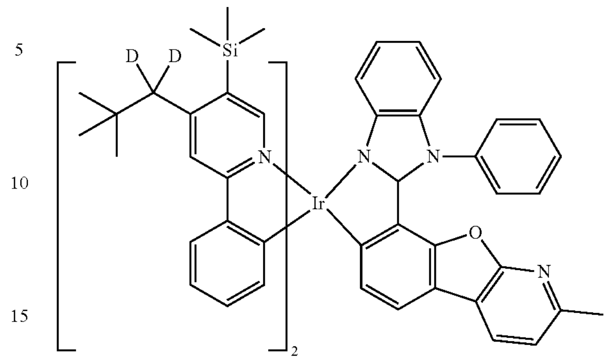
1140
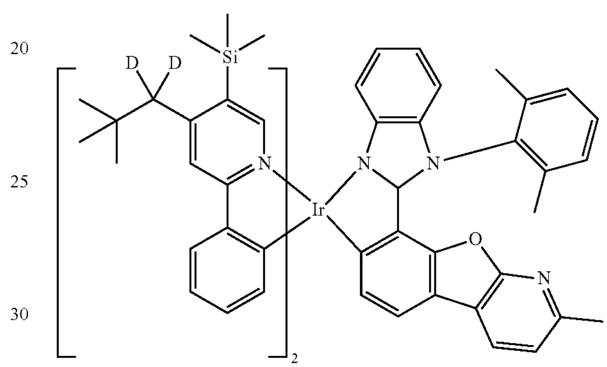
1141
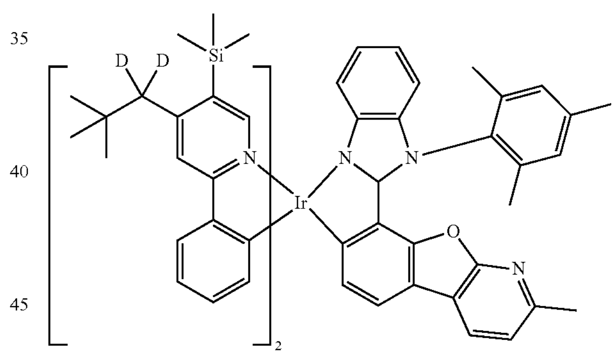
1142
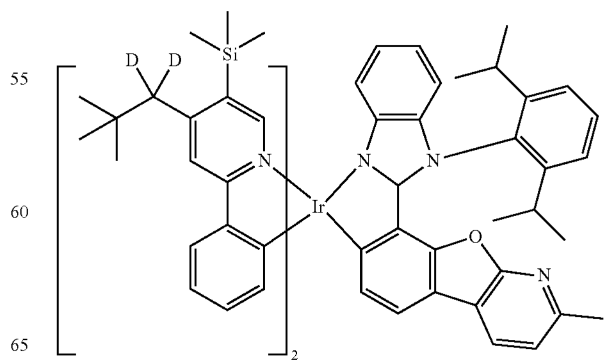

-continued
1143
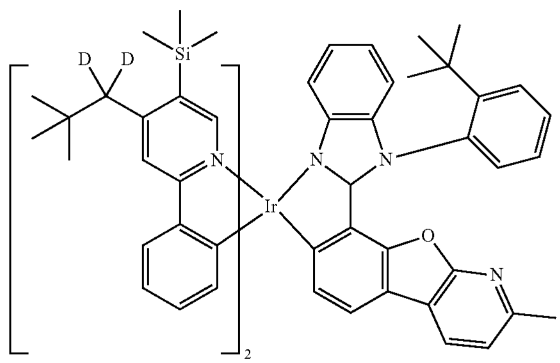
1144
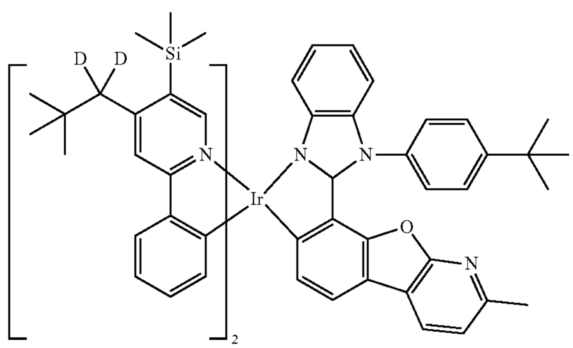
1145
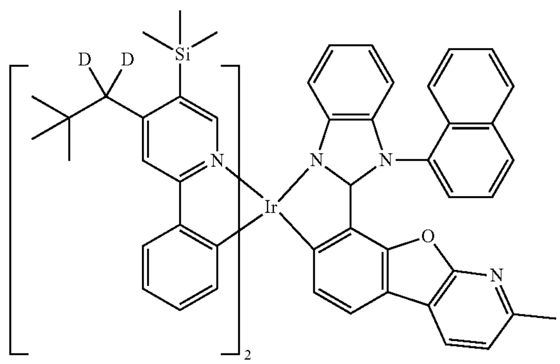
1146
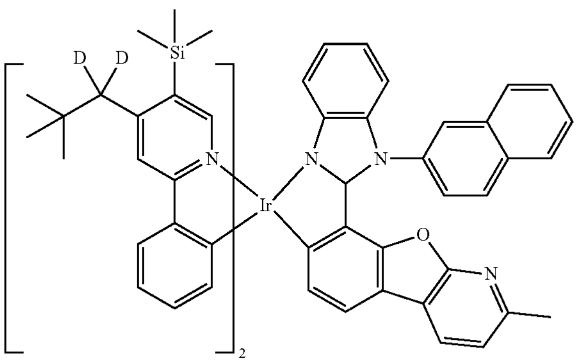
-continued
1147
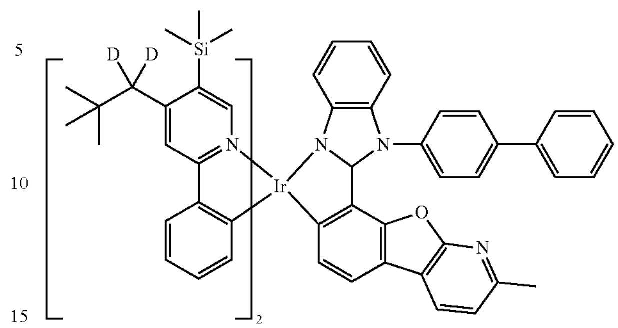
1148
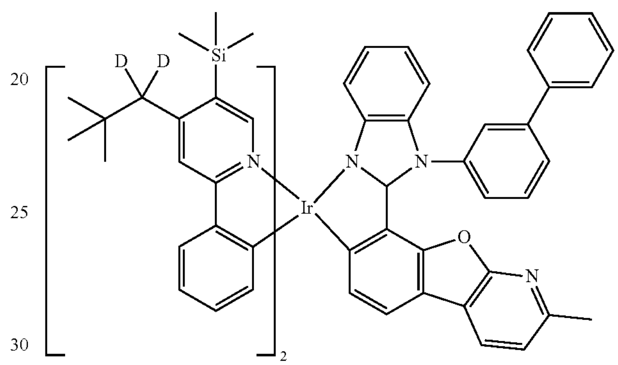
1149
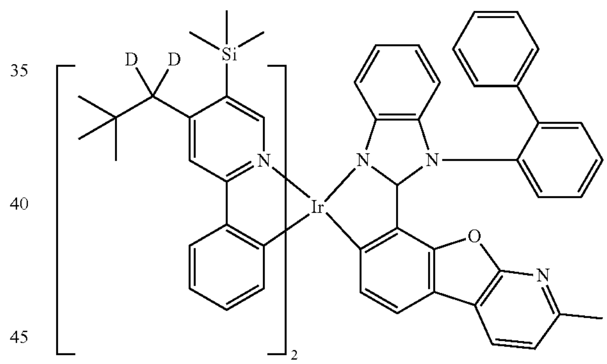
1150
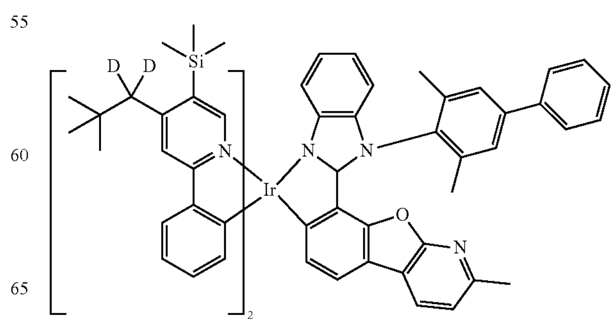

-continued
1151
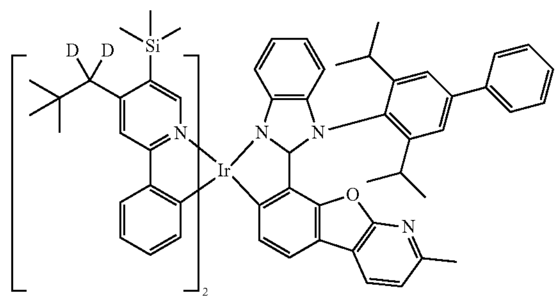
1152
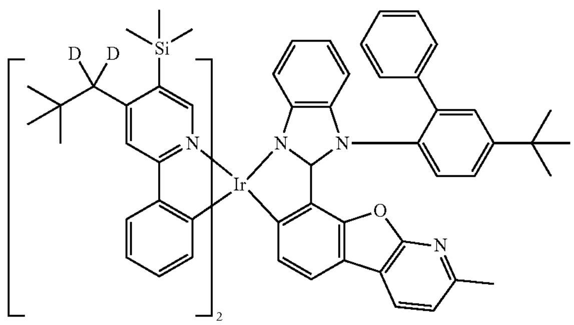
1153
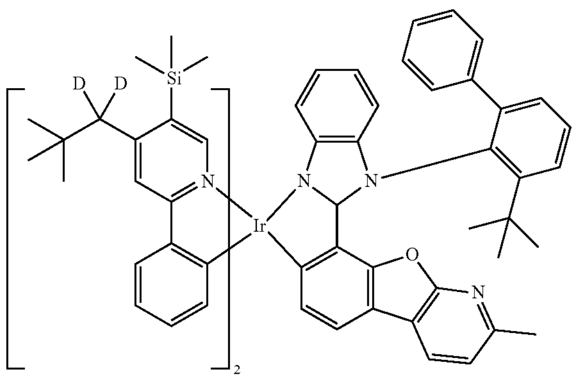
1154
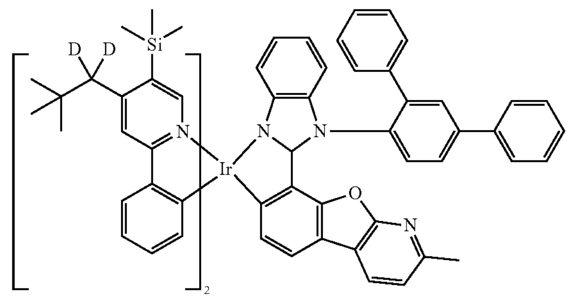
-continued
1155
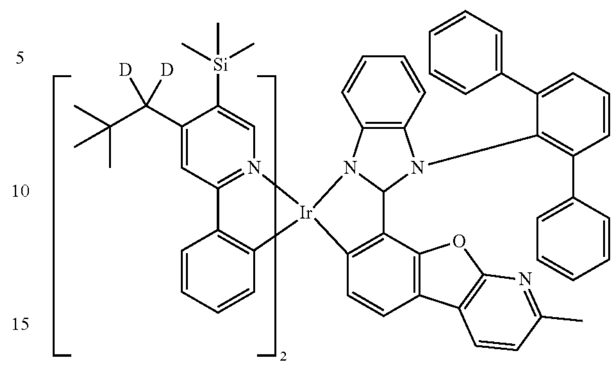
1156
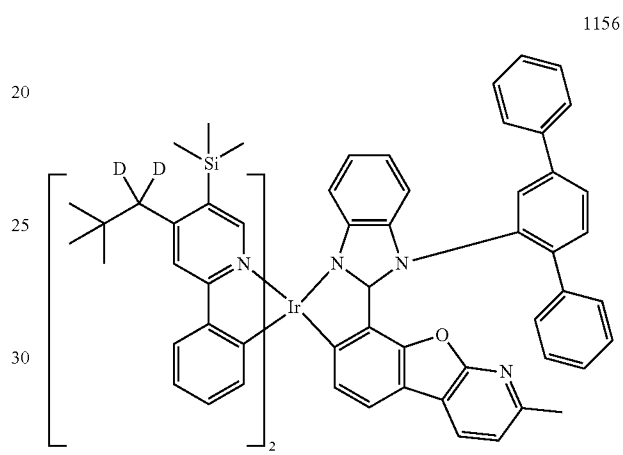
1157
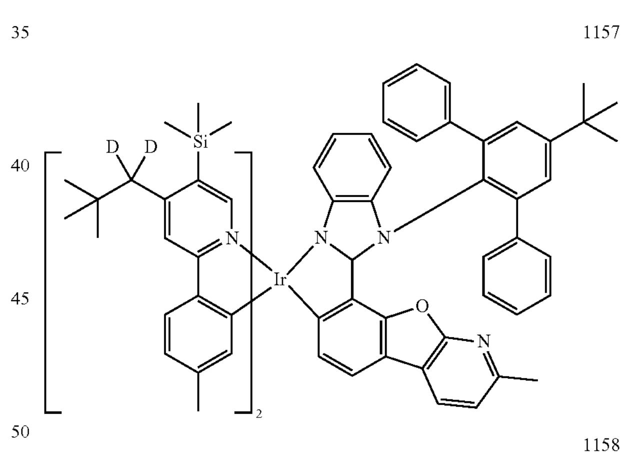
1158
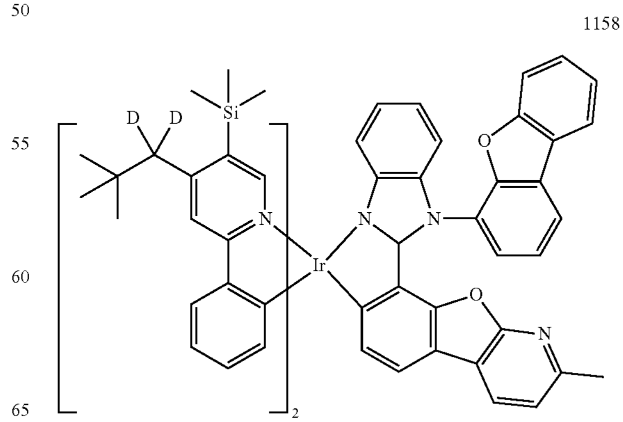

-continued
1159
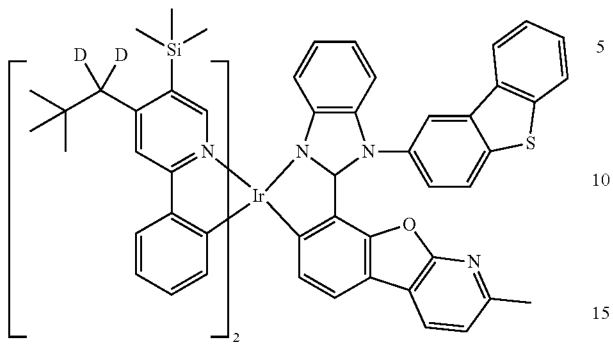
1160
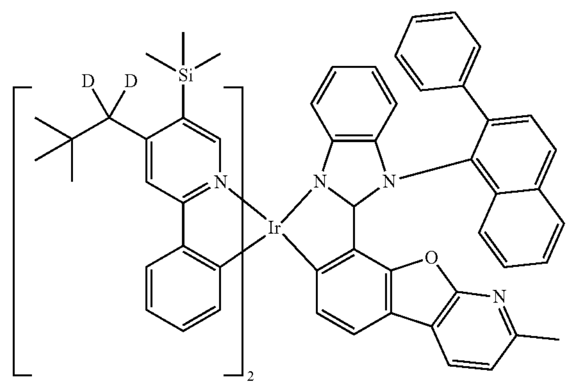
1161
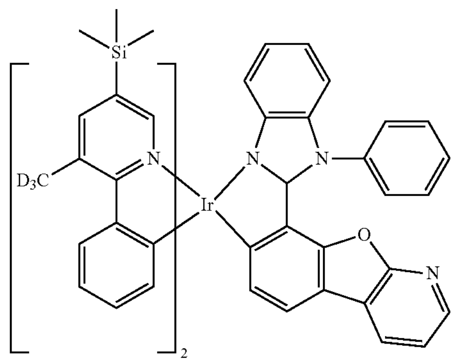
1162
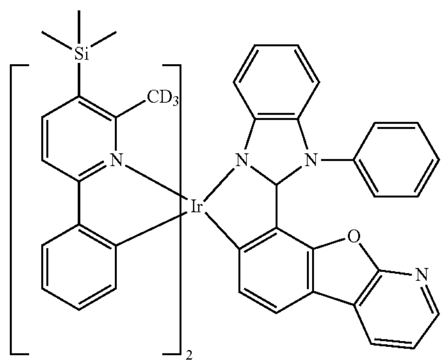
-continued
1163
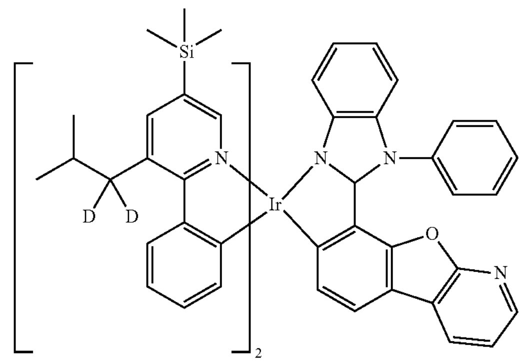
1164
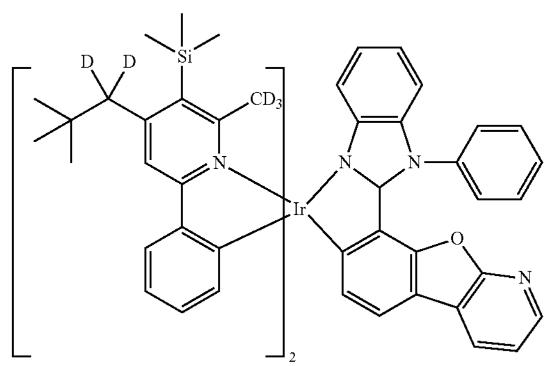
1165
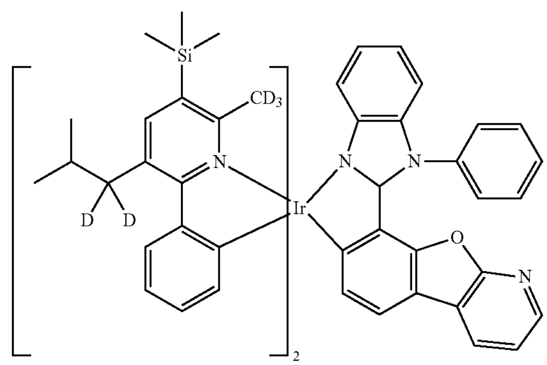
1166
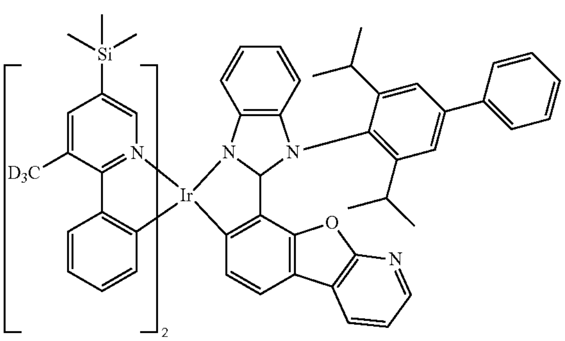

-continued
1167
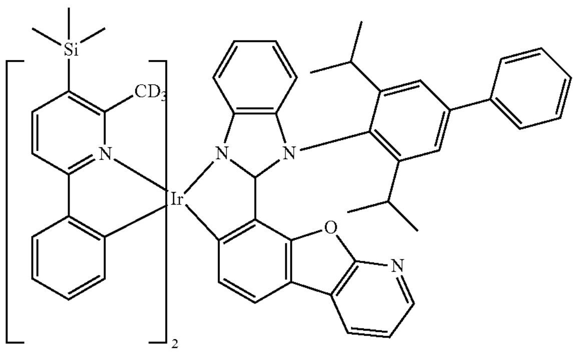
1168
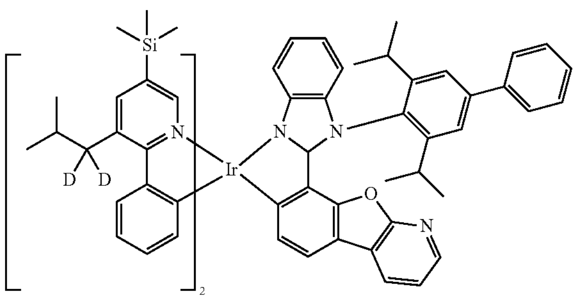
1169
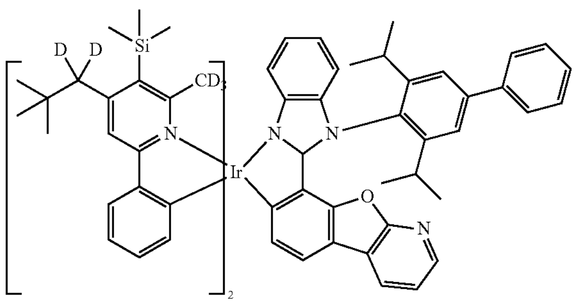
1170
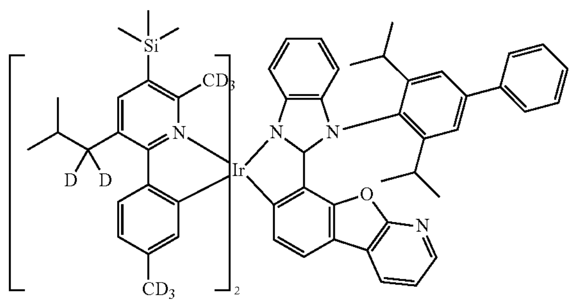
1171
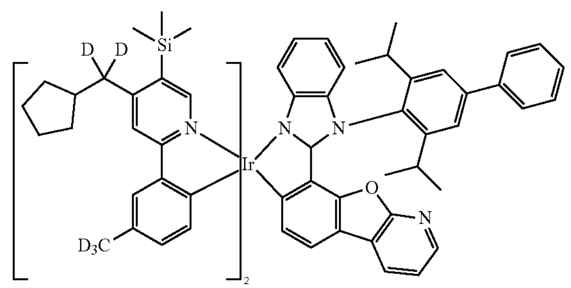
-continued
1172
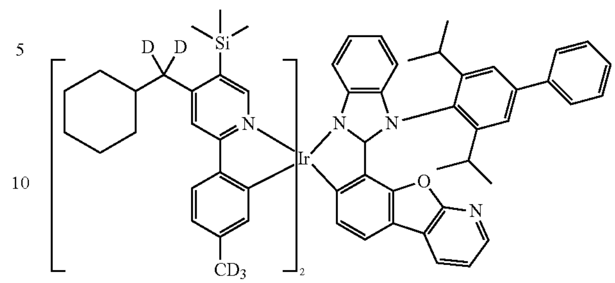
1173
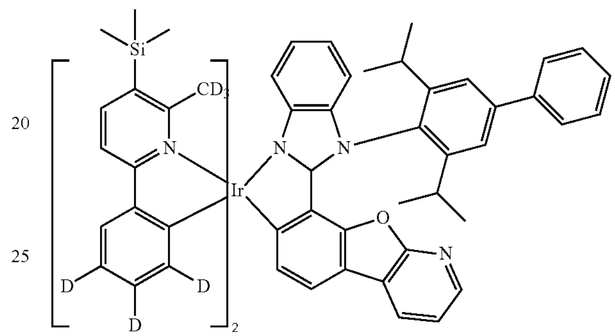
1174
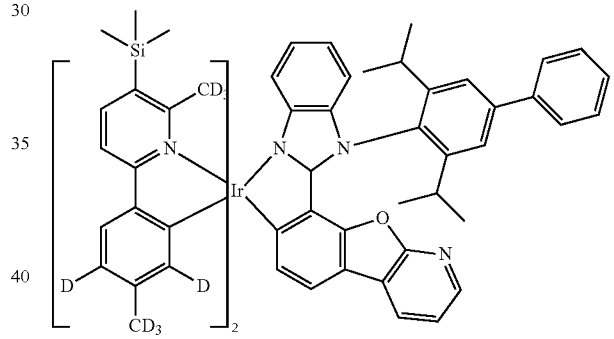
1175
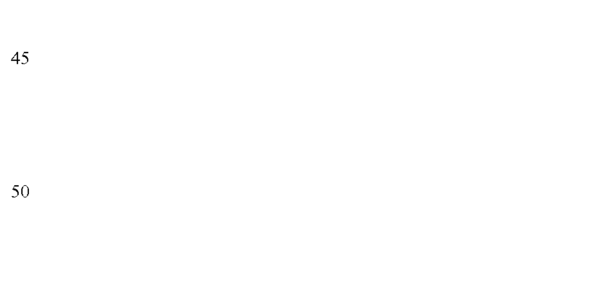
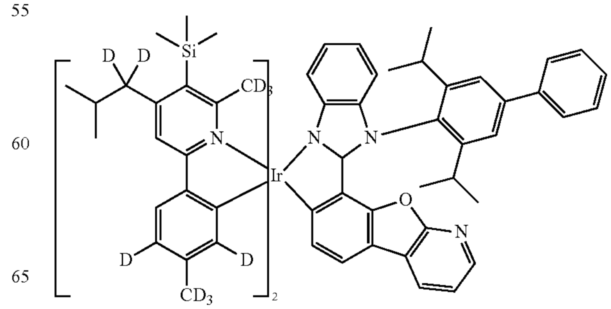

-continued
1176
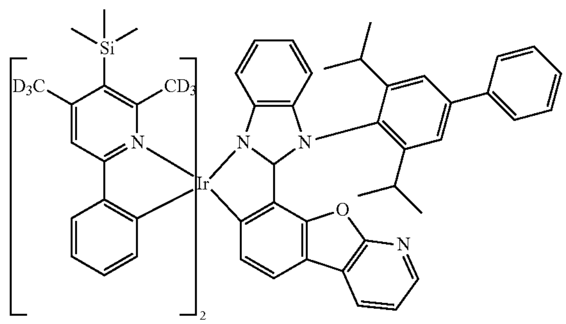
1177
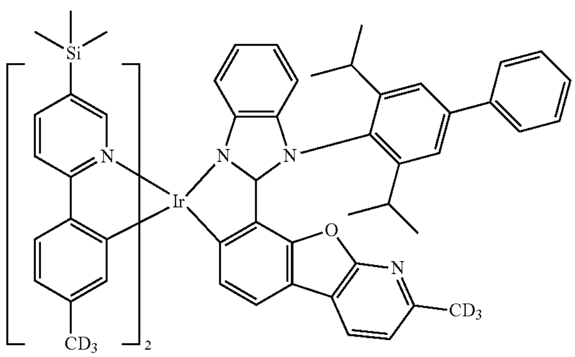
1178
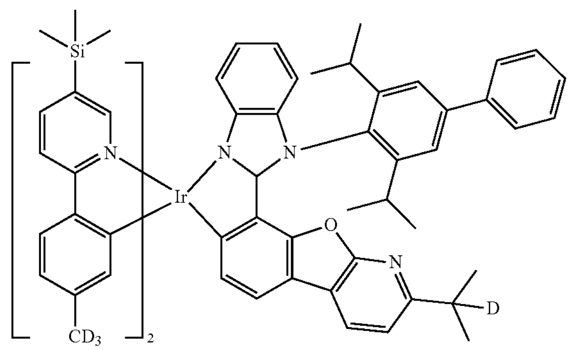
1179
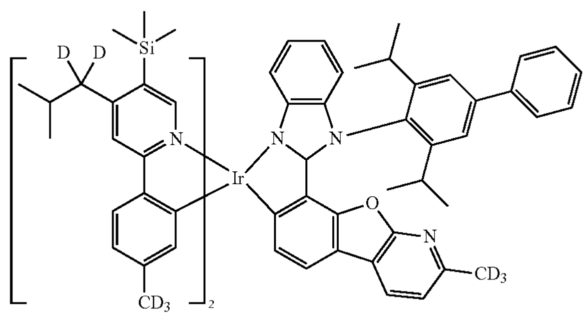
-continued
1180
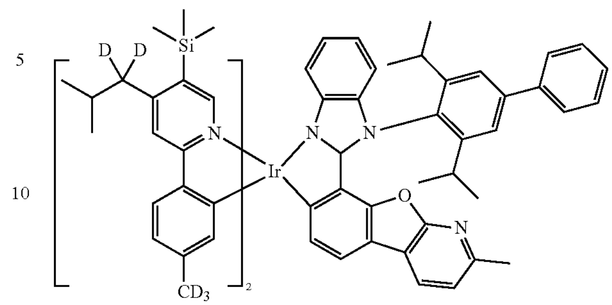
1181
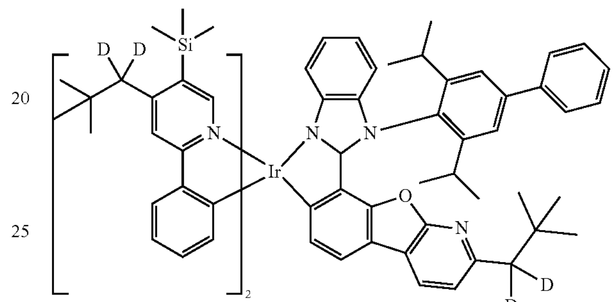
1182
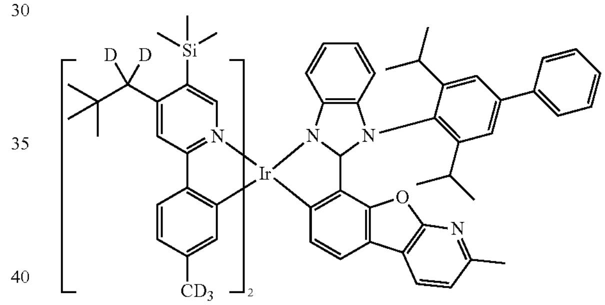
1183
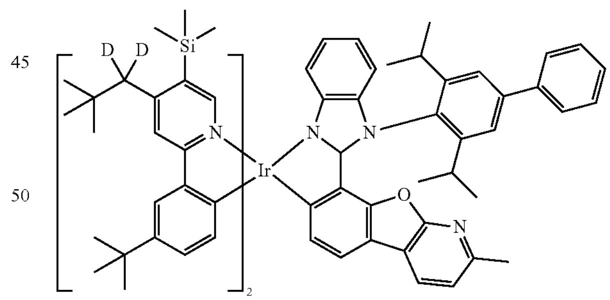
1184
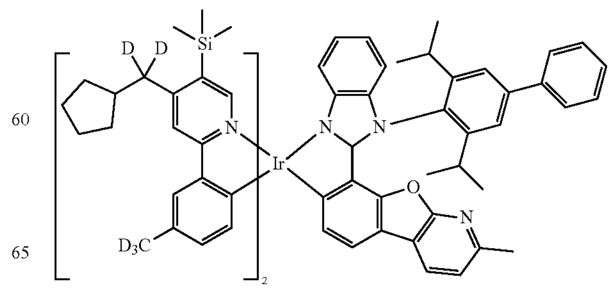

-continued
1185
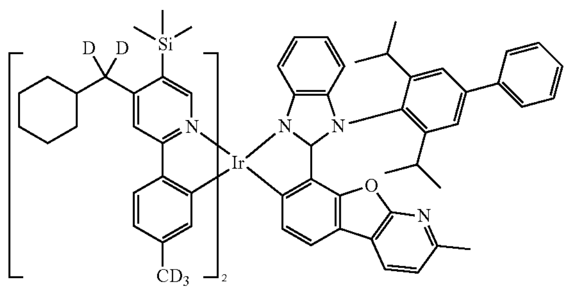
1186
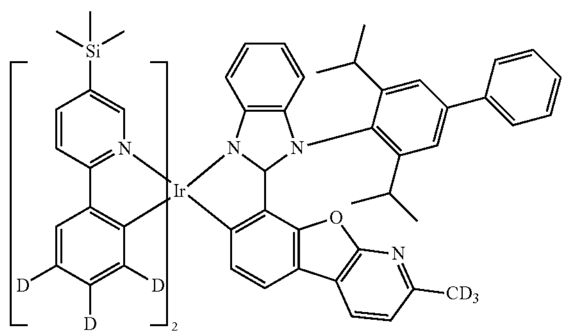
1187
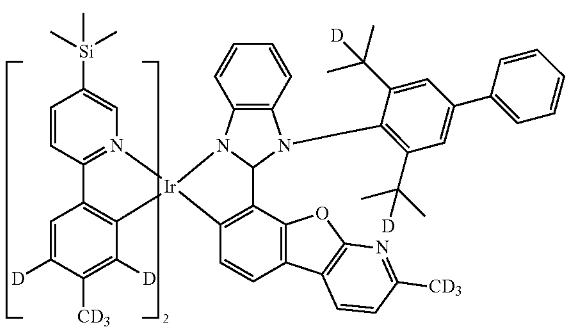
1188
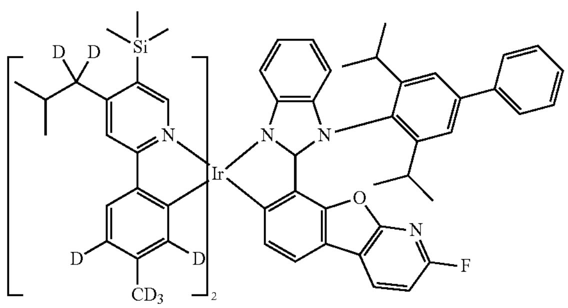
-continued
1189
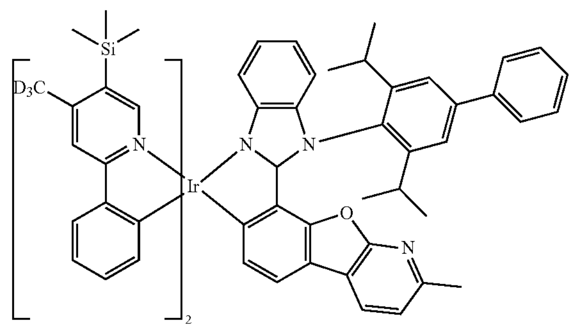
1190
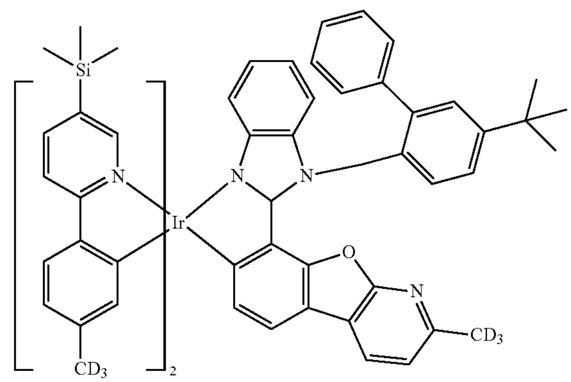
1191
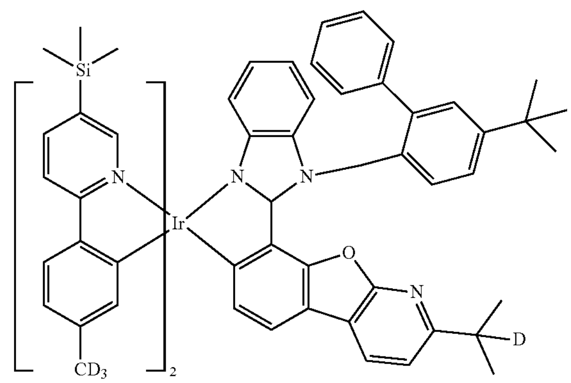
1192
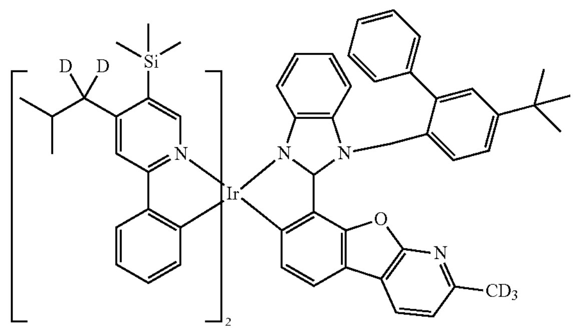

-continued
1193
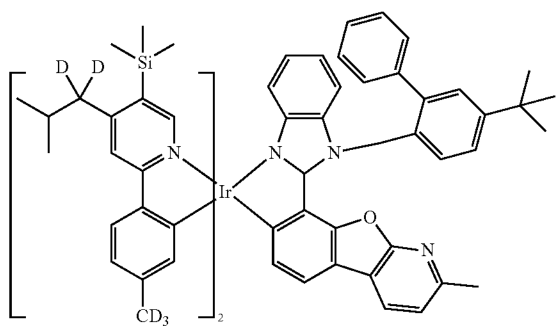
1194
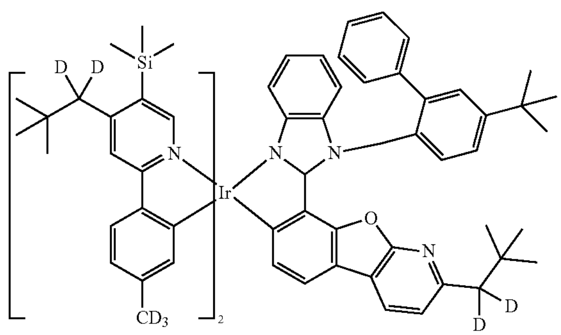
1195
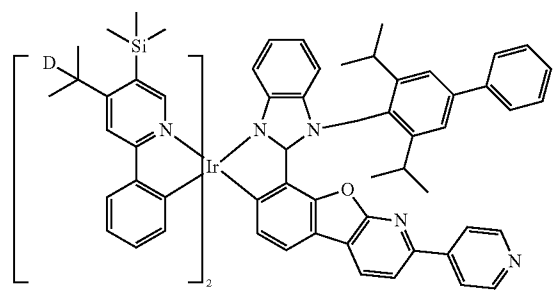
1196
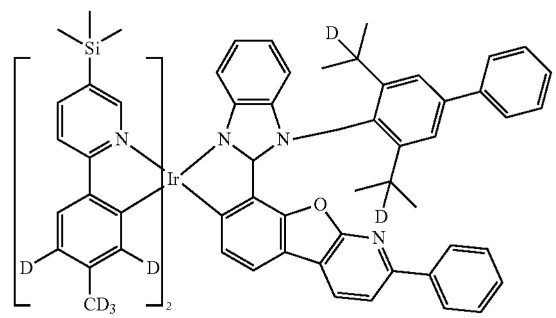
-continued
1197
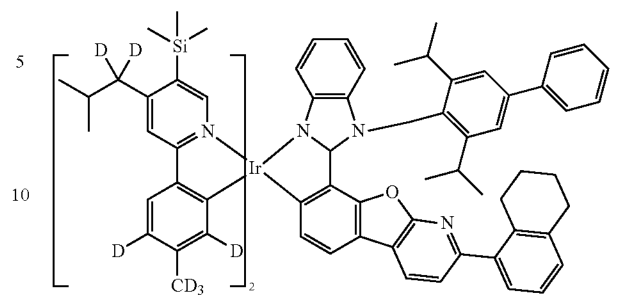
1198
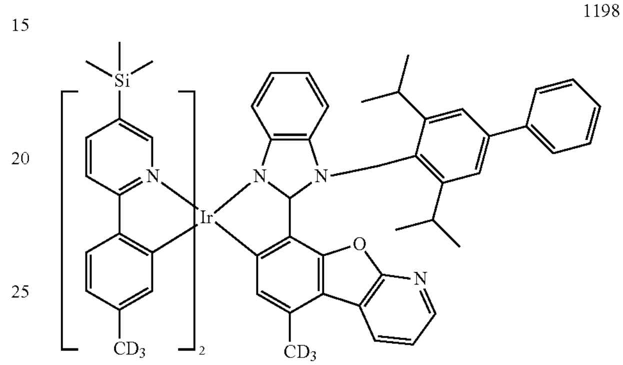
1199
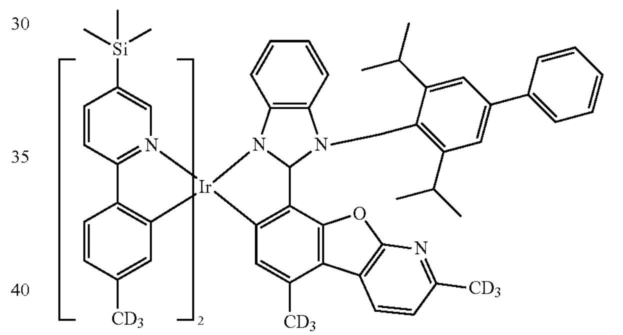
1200
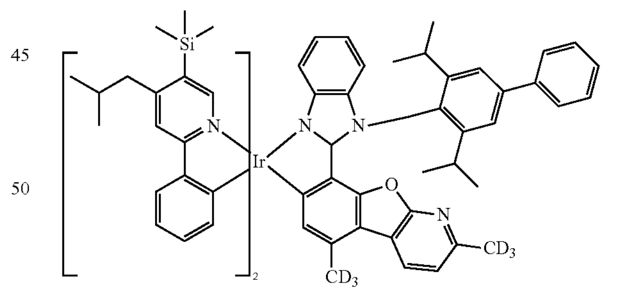
1201
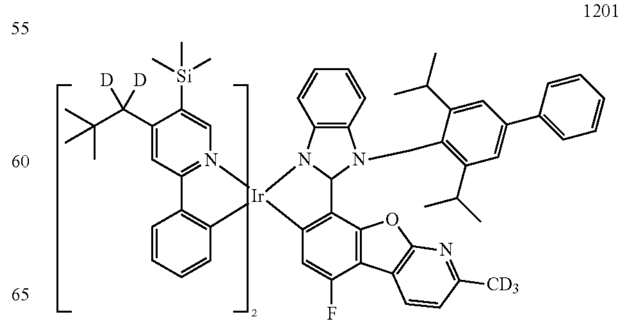

-continued
1202
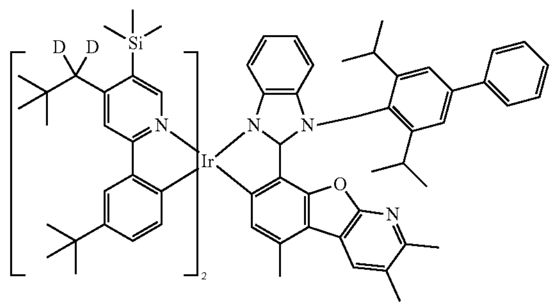
1203
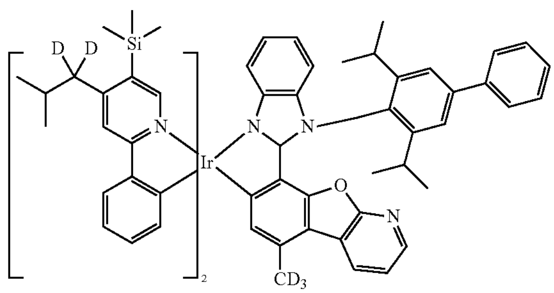
1204
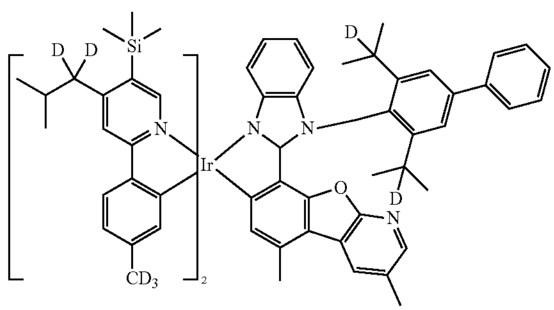
1205
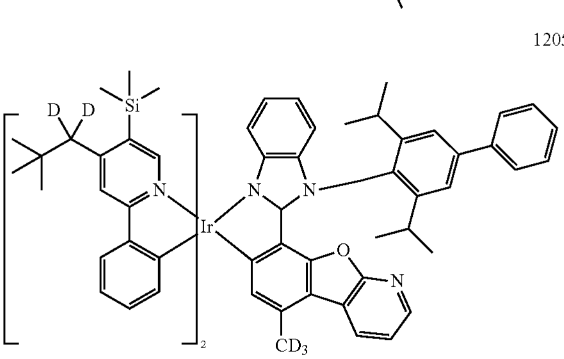
1206
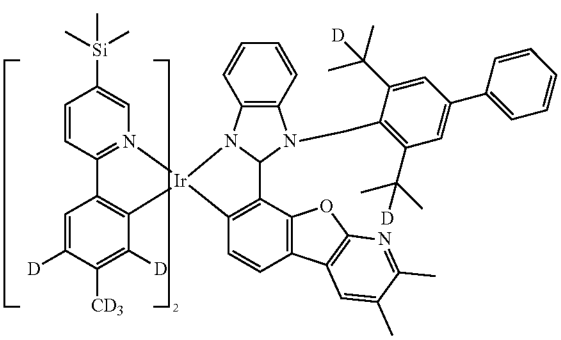
-continued
1207
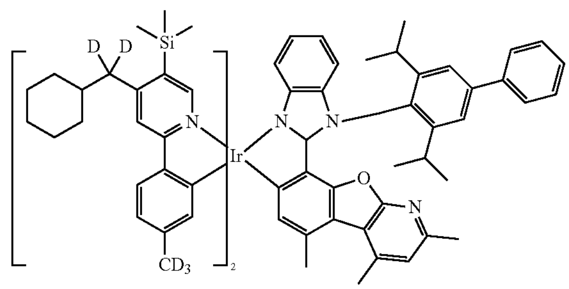
1208
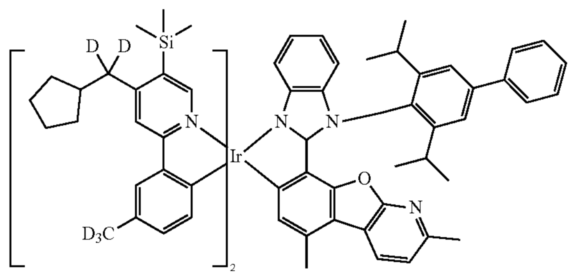
1209
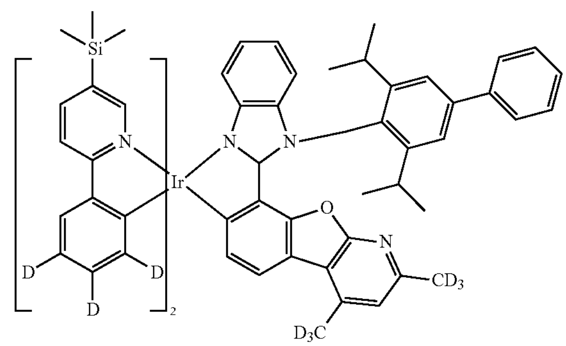
1210
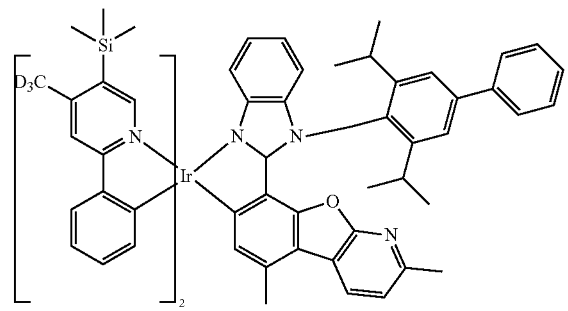

1211
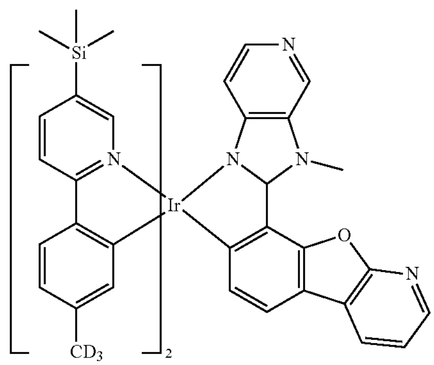
1212
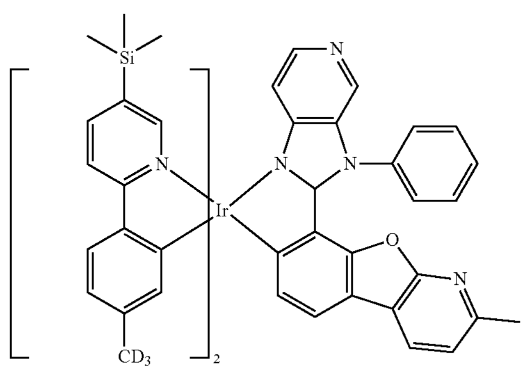
1213
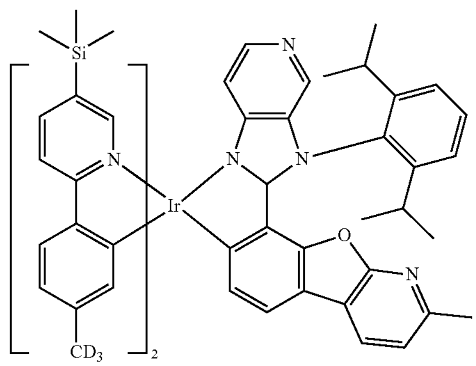
1214
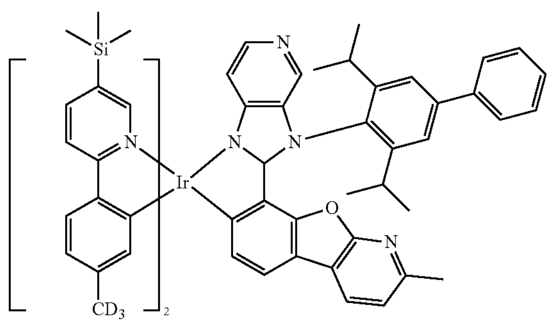
1215
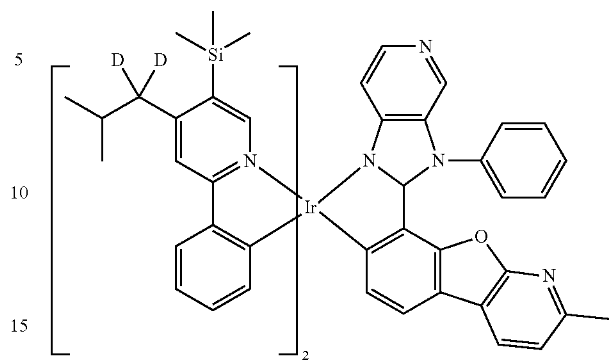
1216
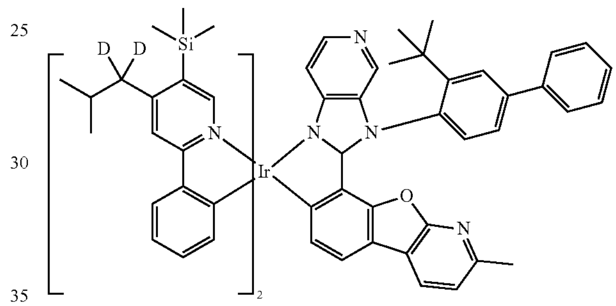
1217
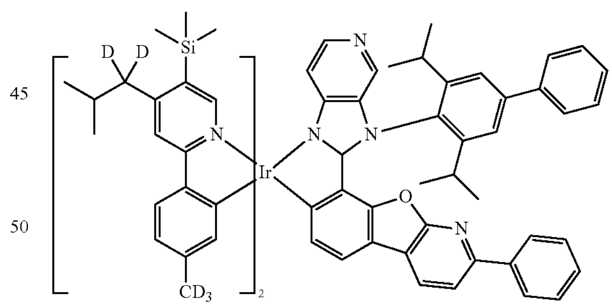
1218
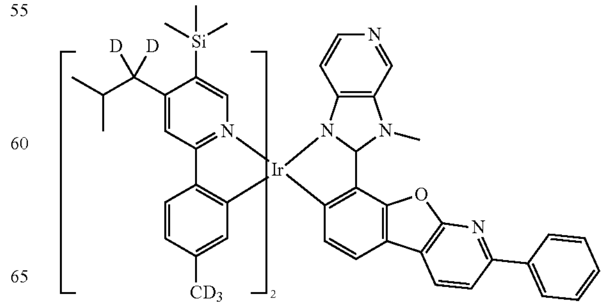

-continued
1219
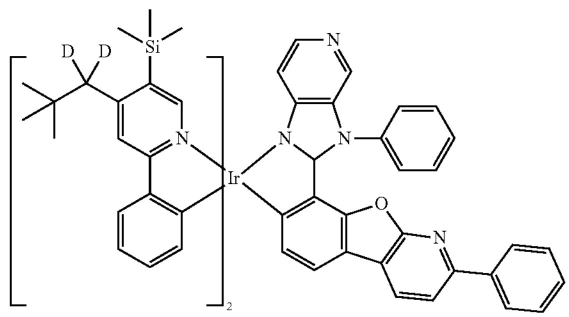
1220
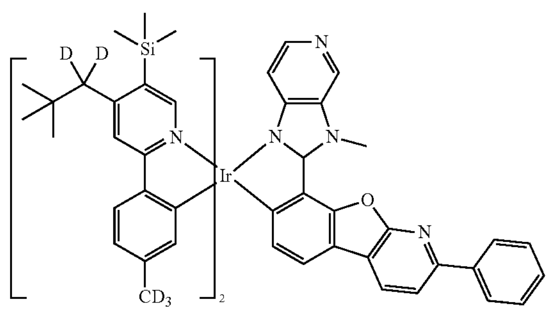
1221
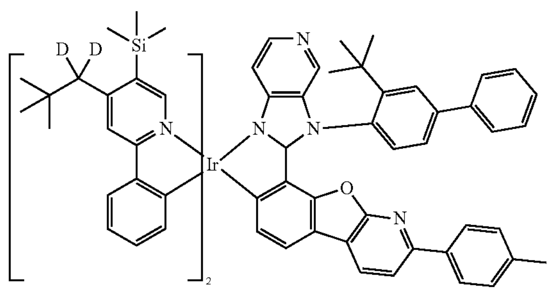
1222
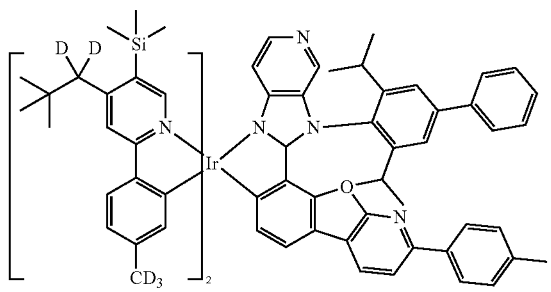
-continued
1223
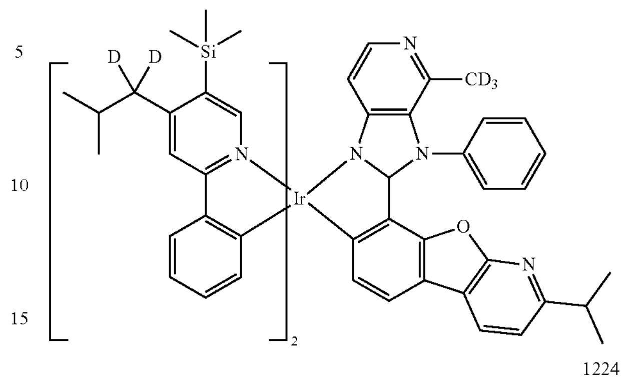
1224
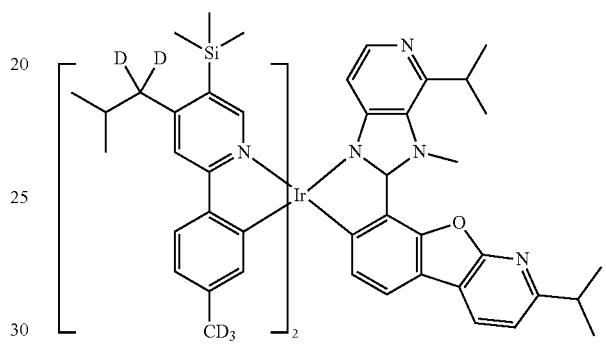
1225
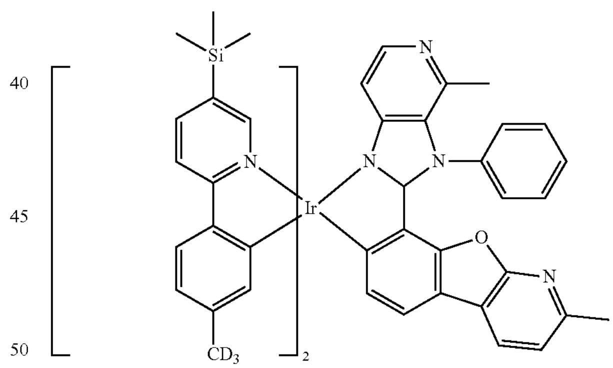
1226
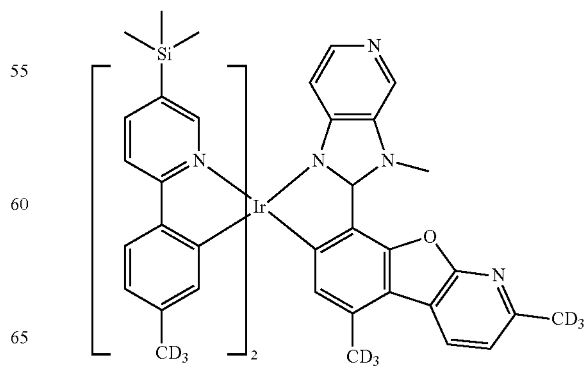

-continued
1227
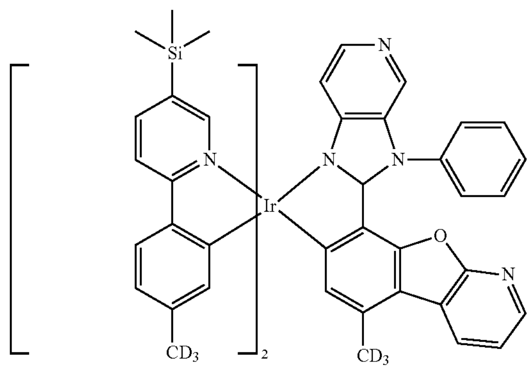
1228
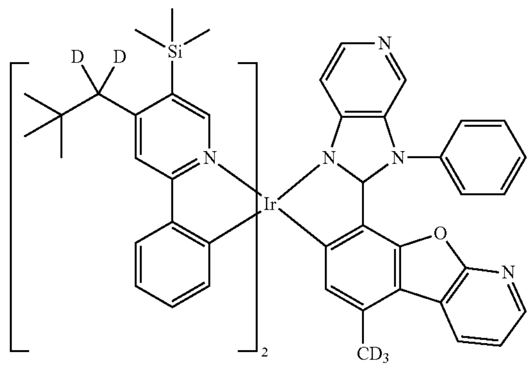
1229
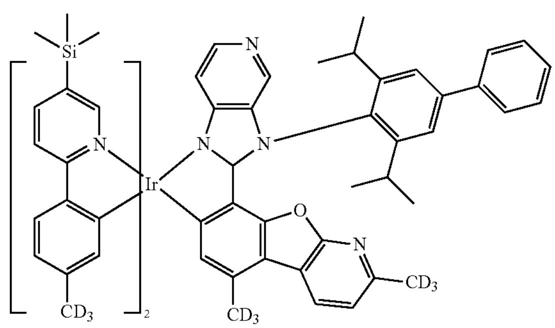
1230
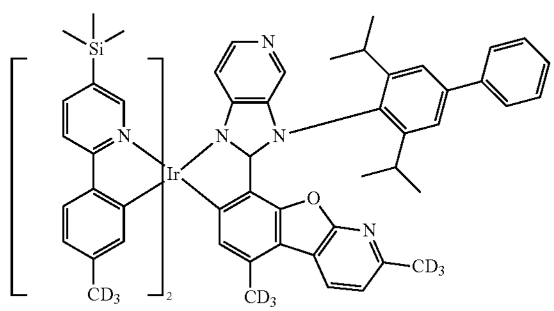
-continued
1231
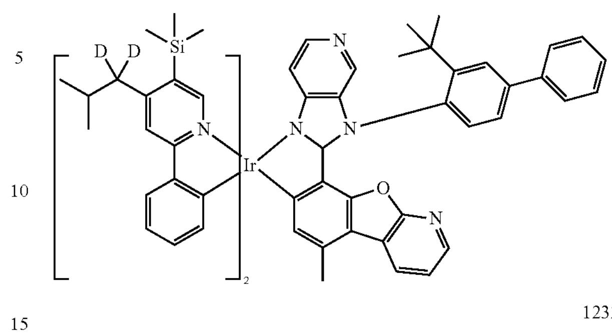
1232
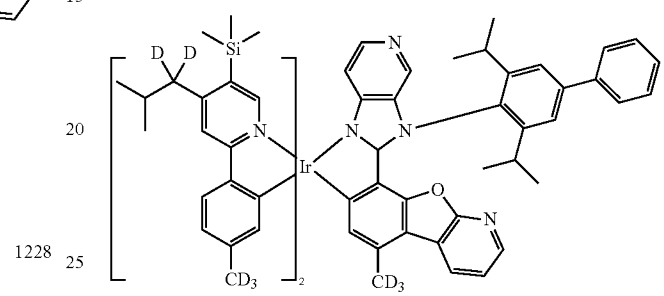
1233
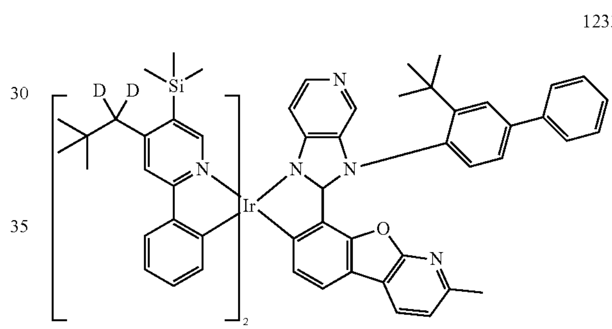
1234
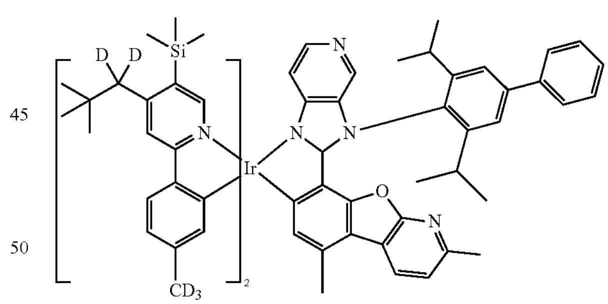
1235
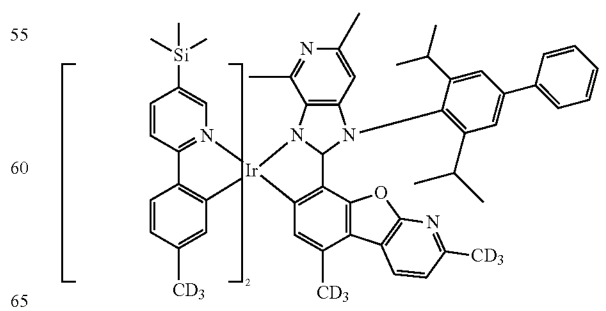

-continued
1236
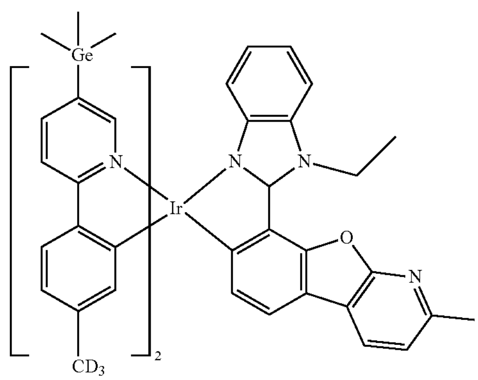
1237
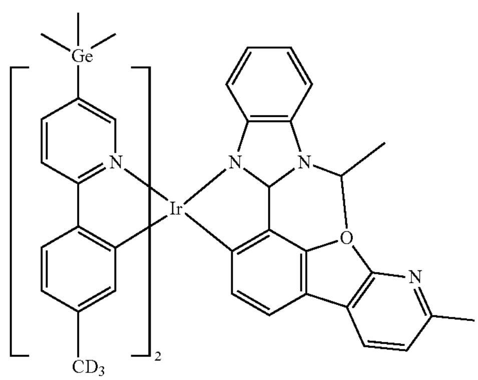
1238
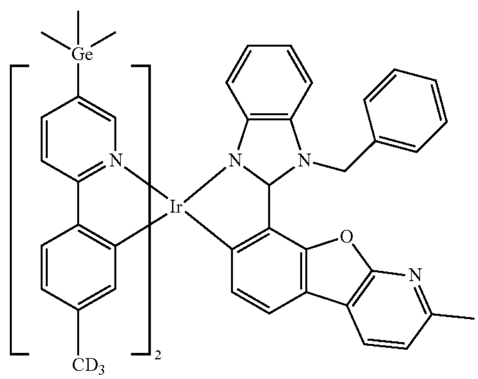
1239
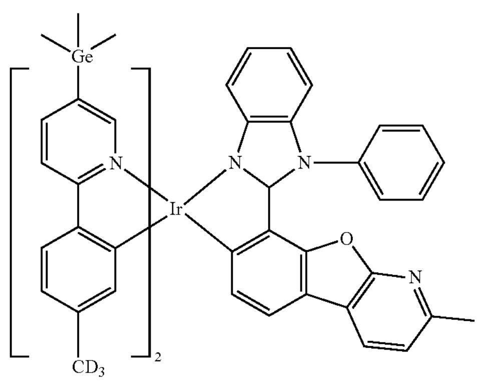
-continued
1240
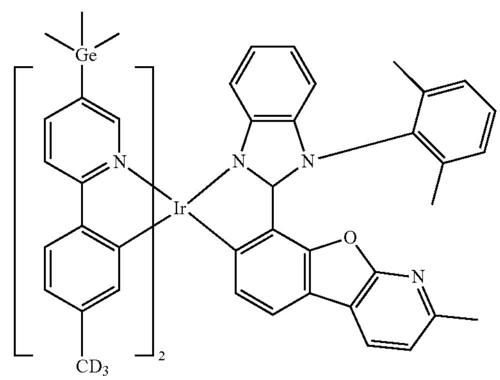
1241
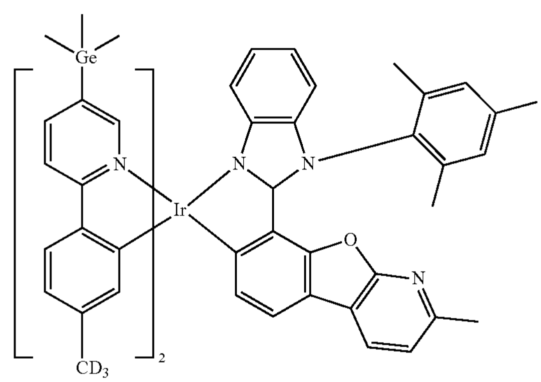
1242
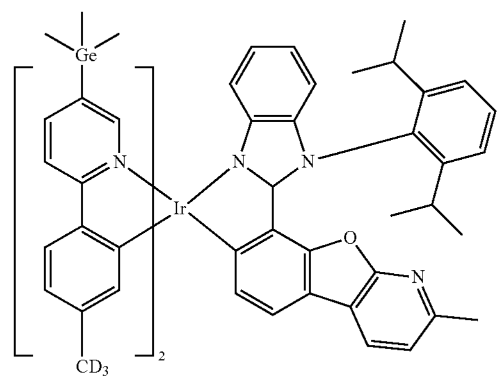
1243
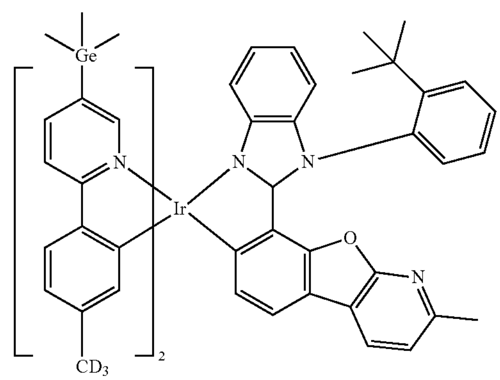

-continued
1244
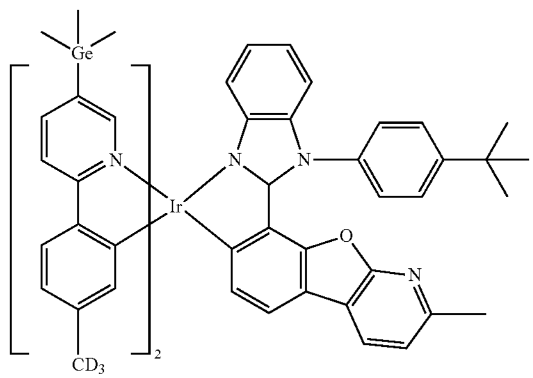
1245
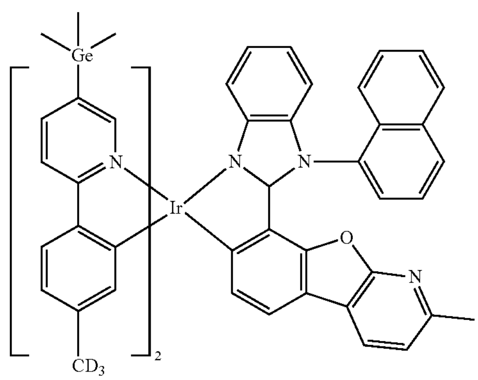
1246
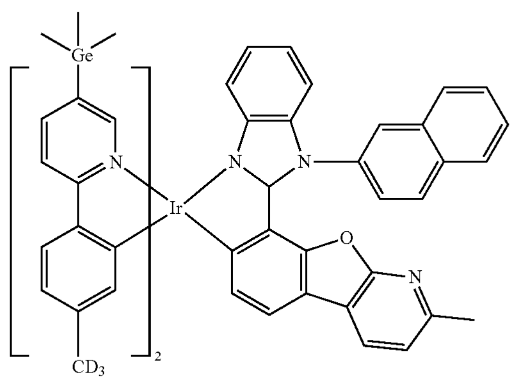
1247
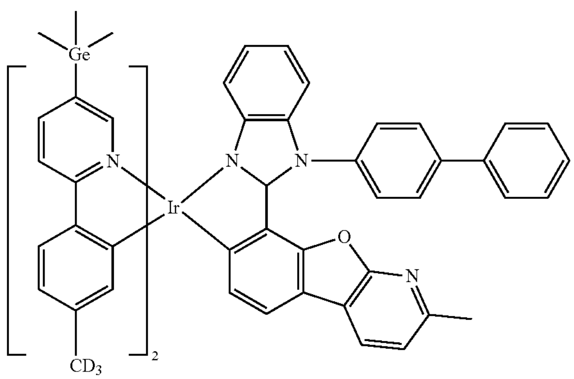
-continued
1248
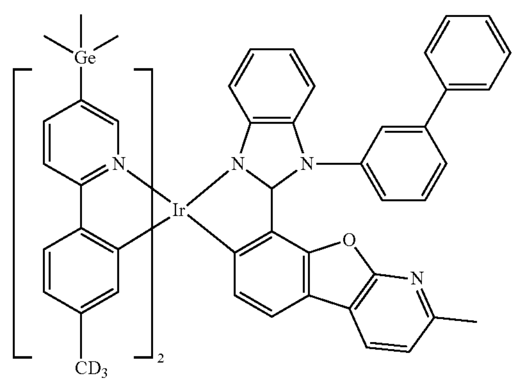
1249
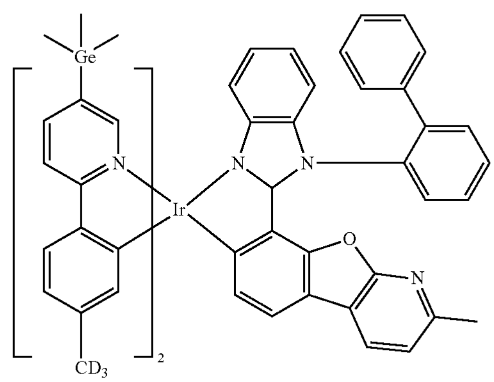
1250
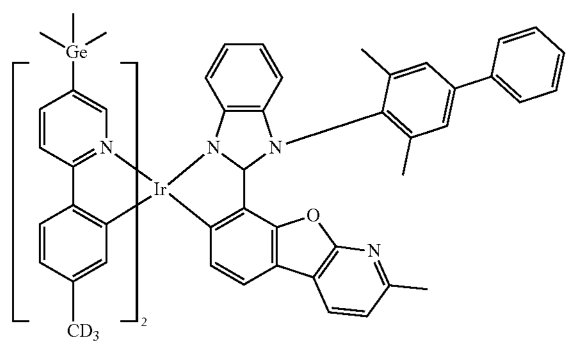
1251
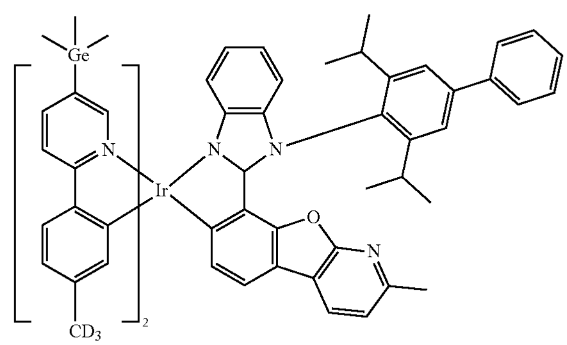

-continued
1252
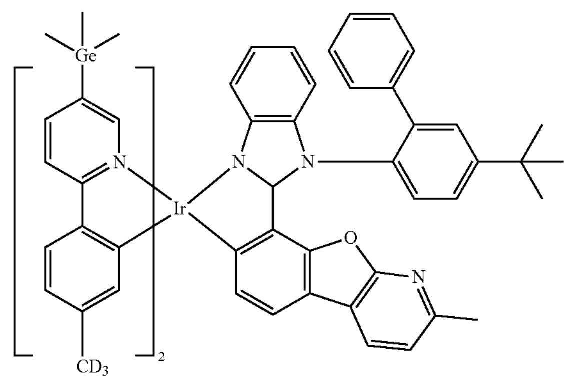
1253
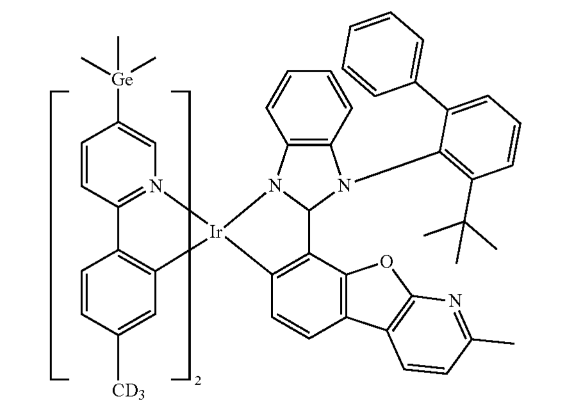
1254
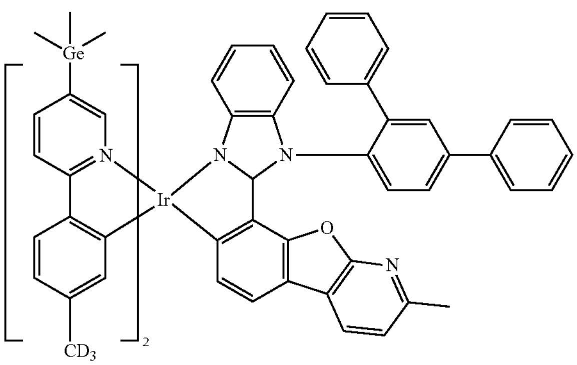
1255
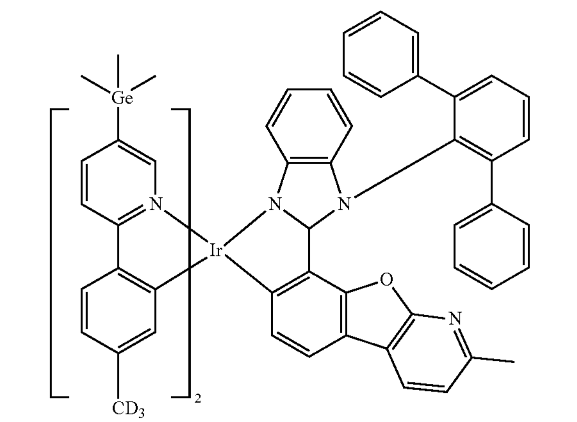
-continued
1256
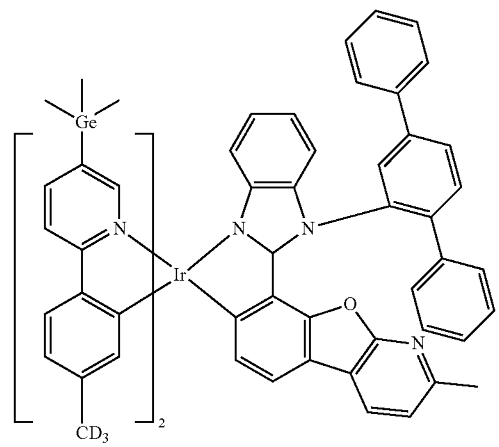
1257
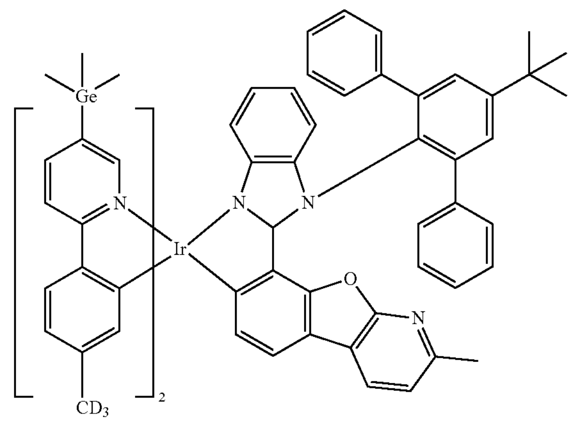
1258
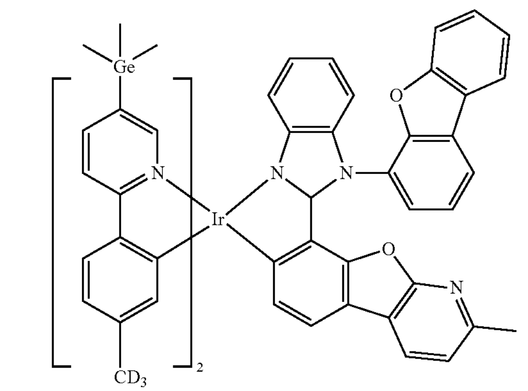

-continued
1259
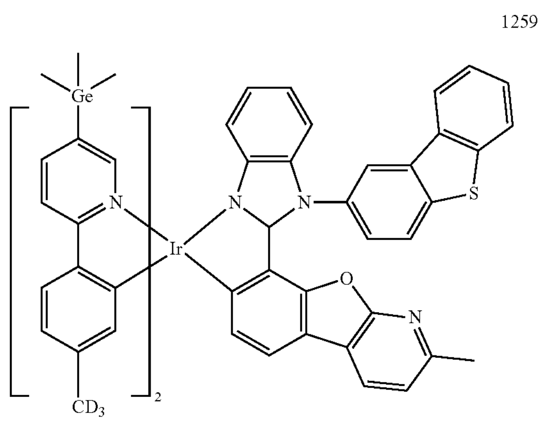
1260
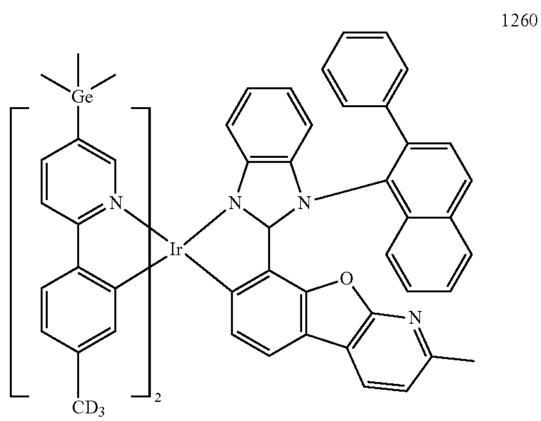
1261
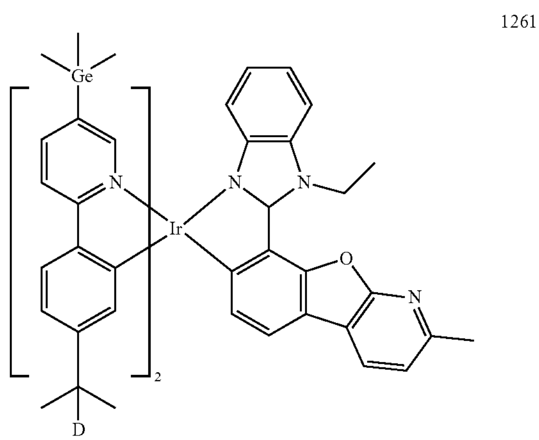
1262
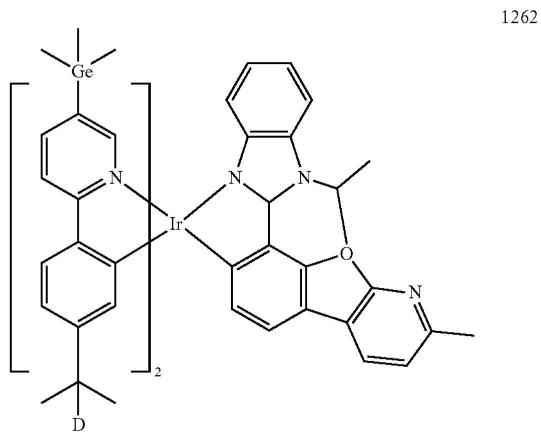
-continued
1263
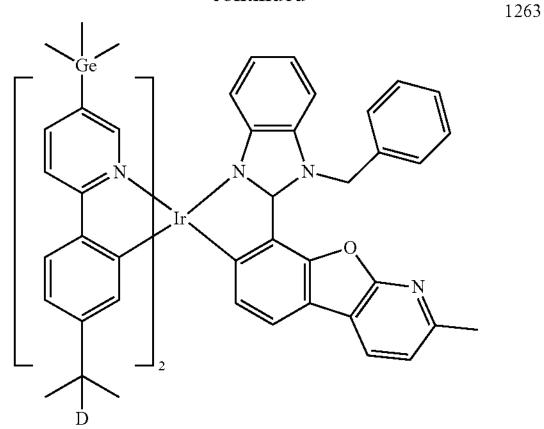
1264
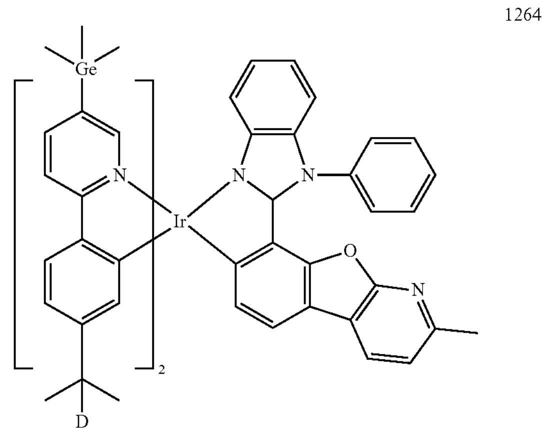
1265
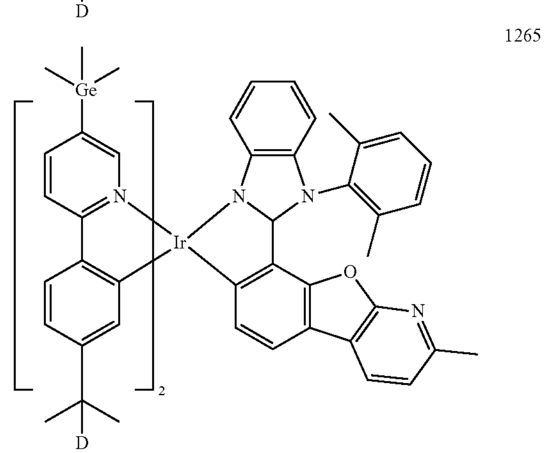
1266
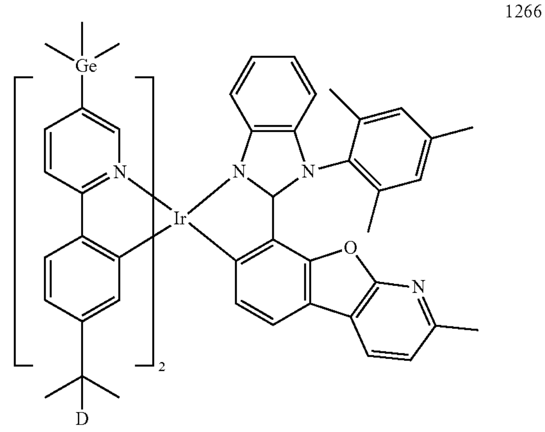

-continued
1267
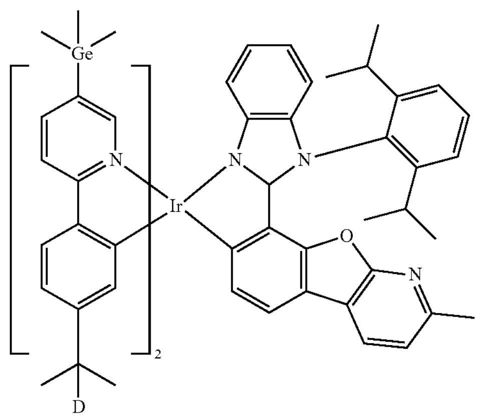
1268
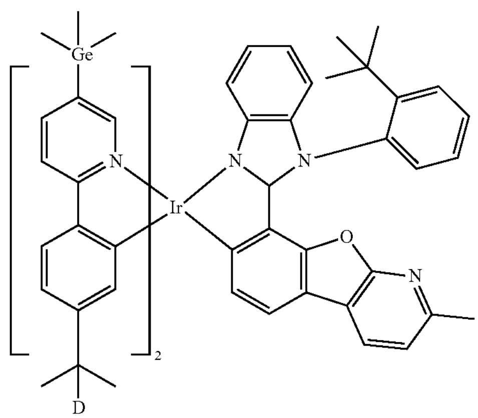
1269
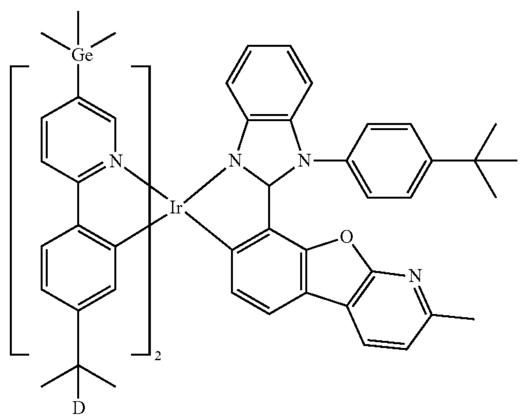
-continued
1270
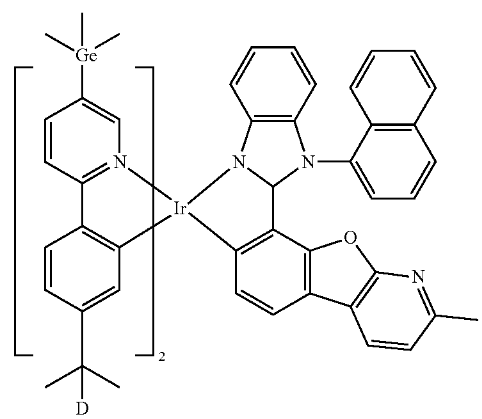
1271
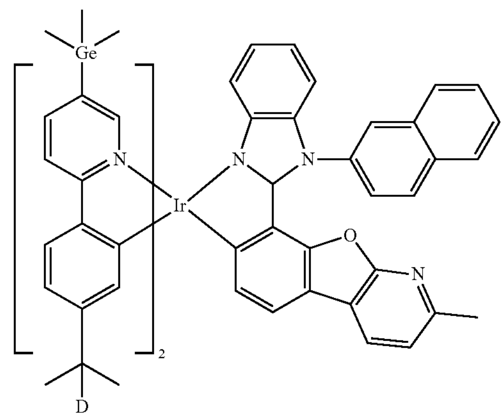
1272
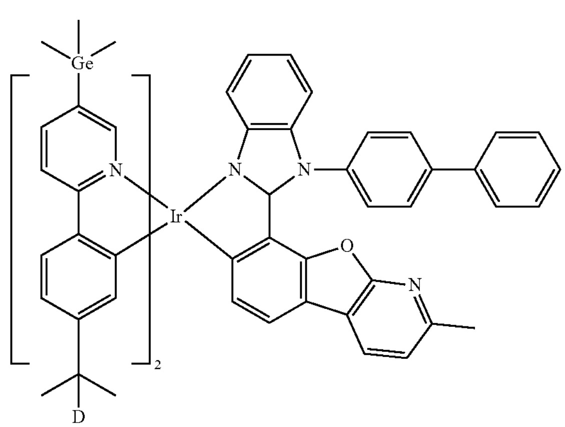

-continued
1273
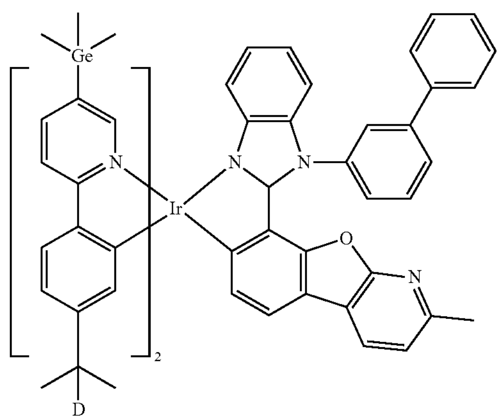
1274
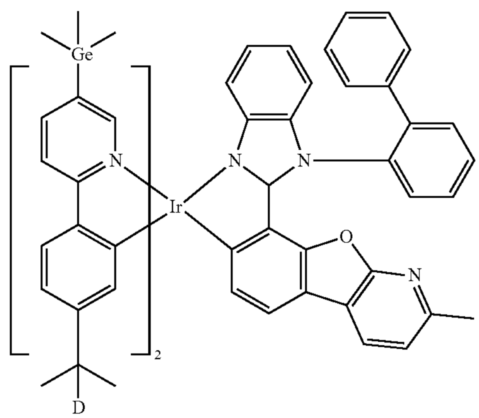
1275
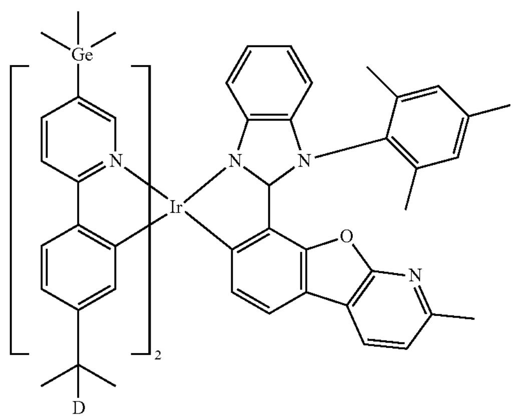
-continued
1276
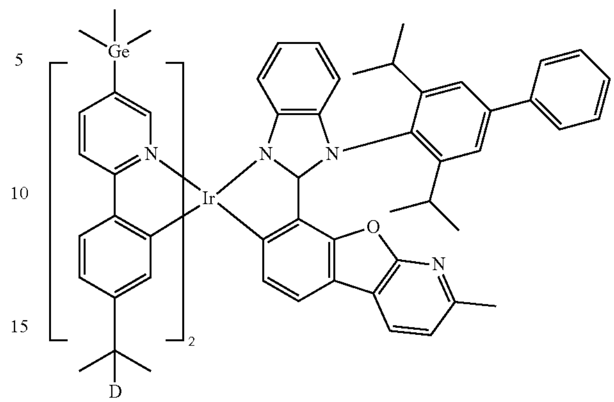
1277
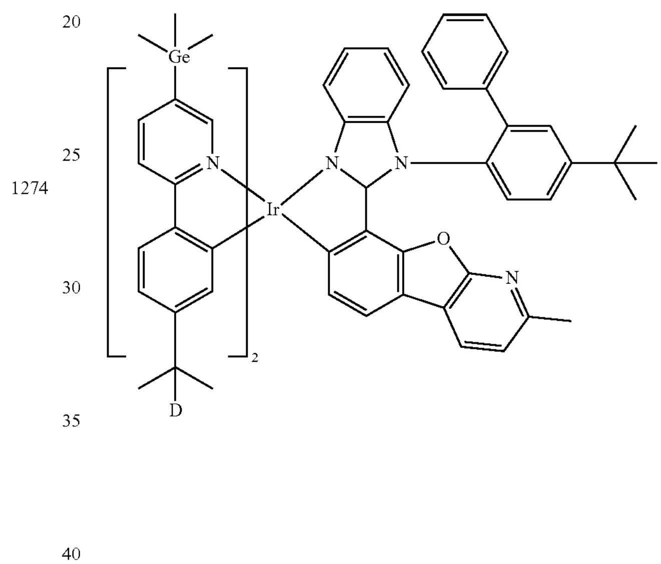
1278
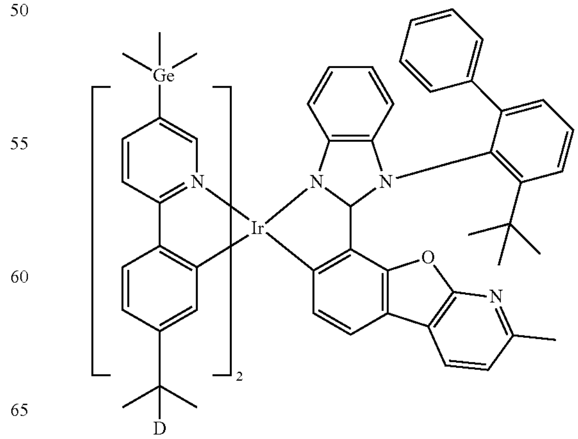

-continued
1279
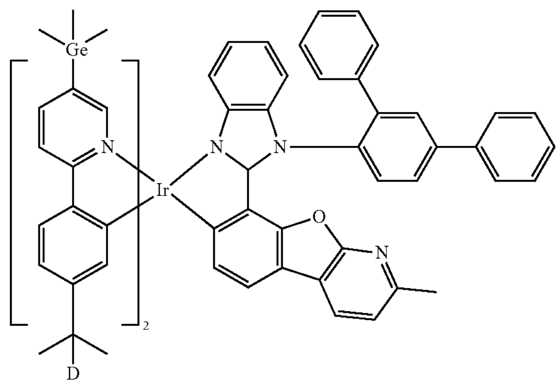
1280
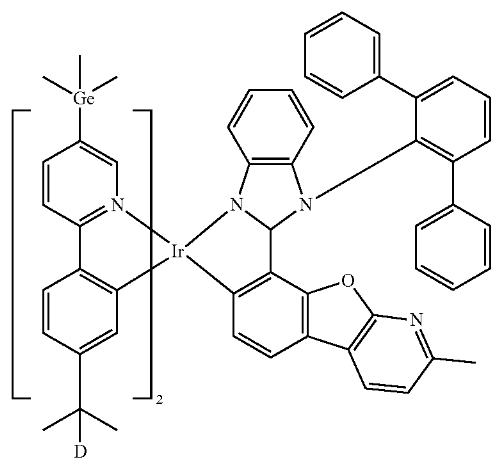
1281
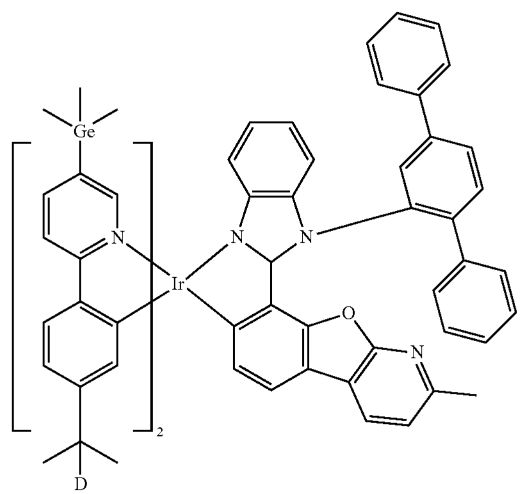
-continued
1282
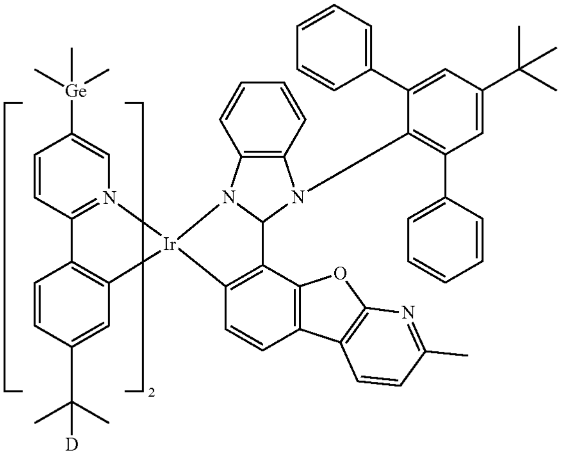
1283
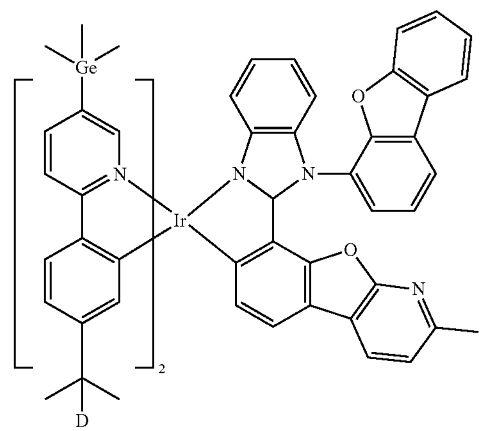
1284
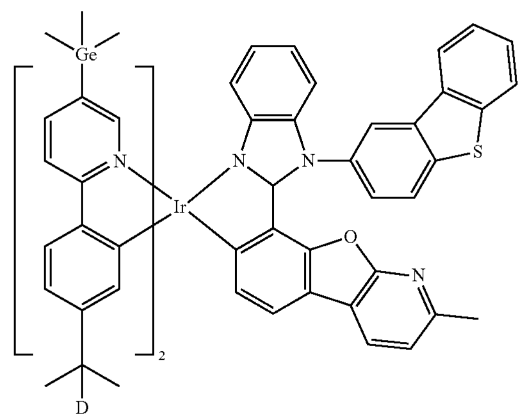

-continued
1285
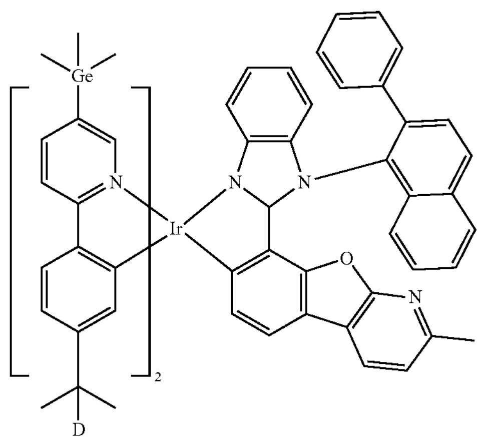
1286
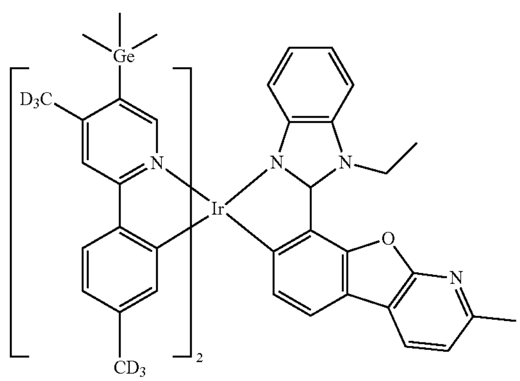
1287
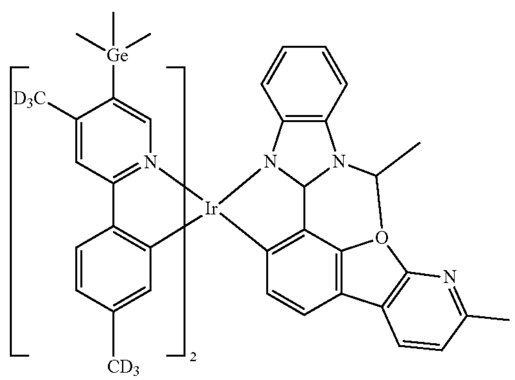
1288
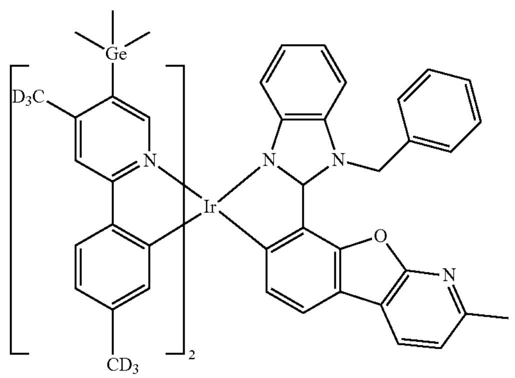
-continued
1289
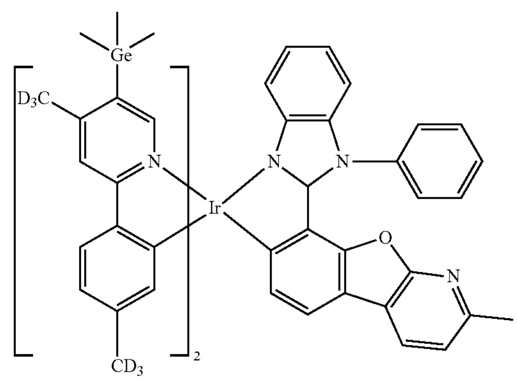
1290
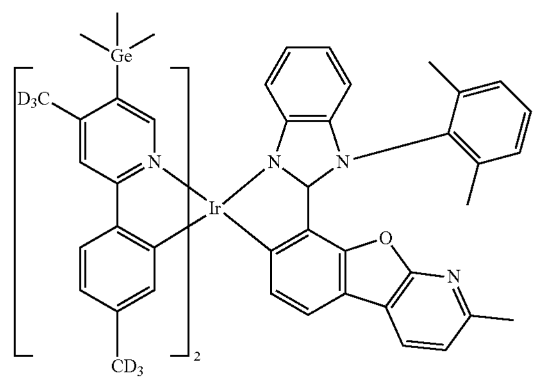
1291
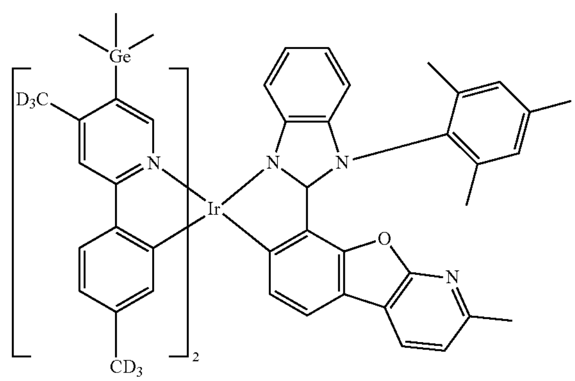
1292
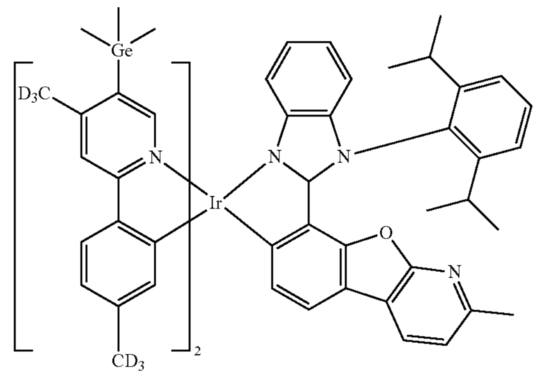

-continued
1293
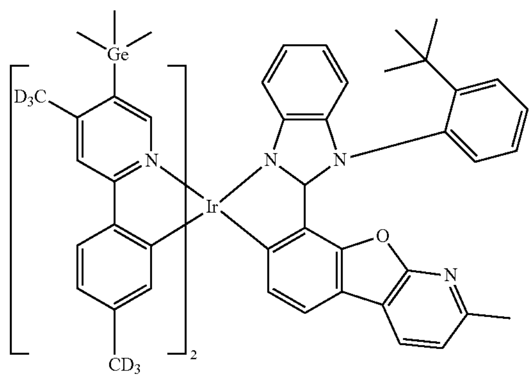
1294
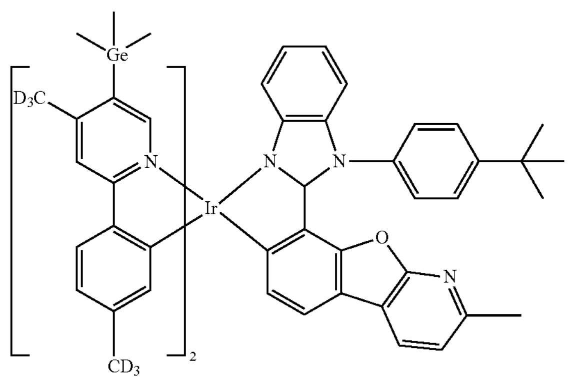
1295
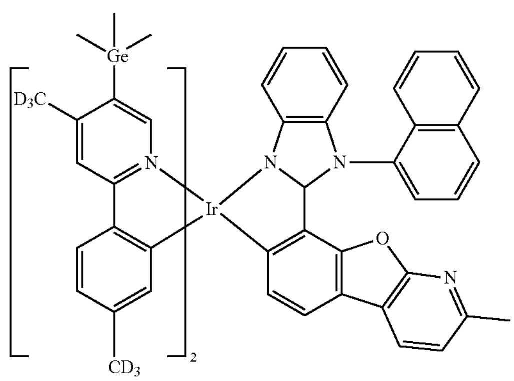
1296
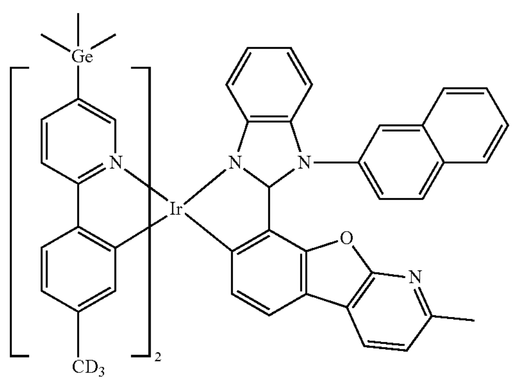
-continued
1297
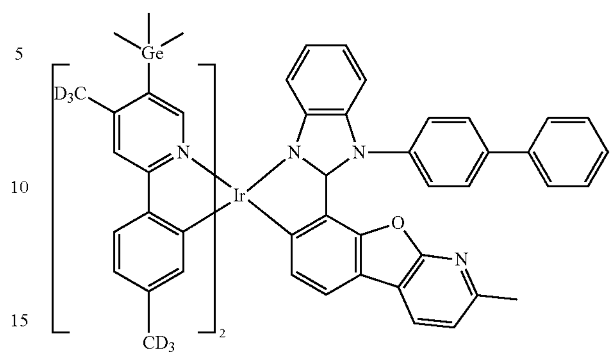
1298
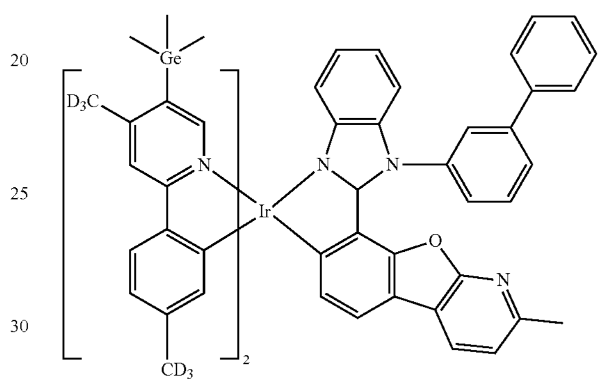
1299
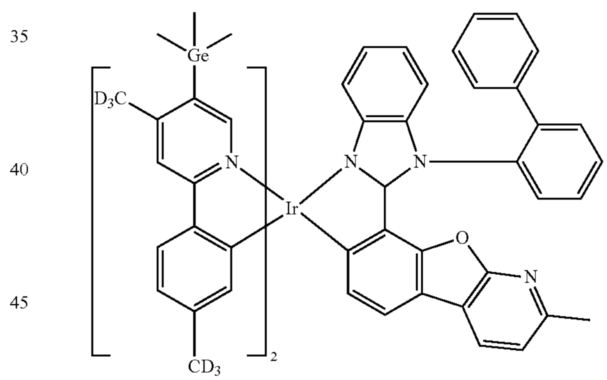
1300
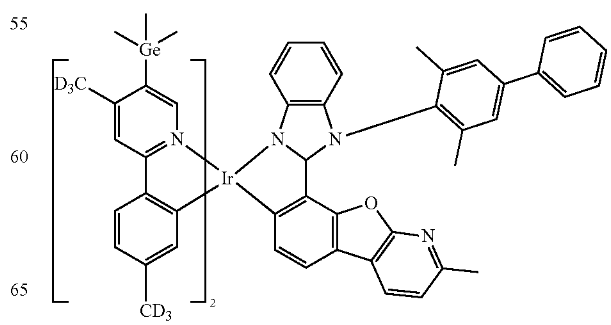

-continued
1301
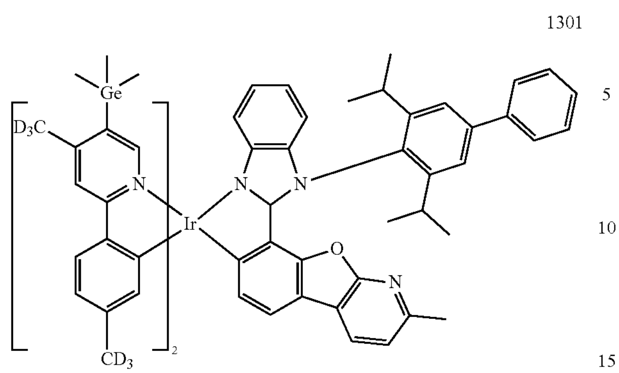
1302
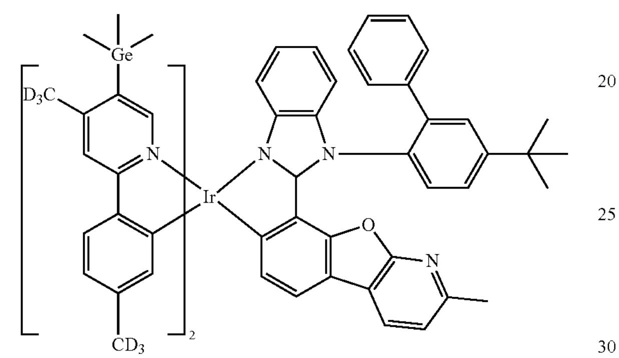
1303
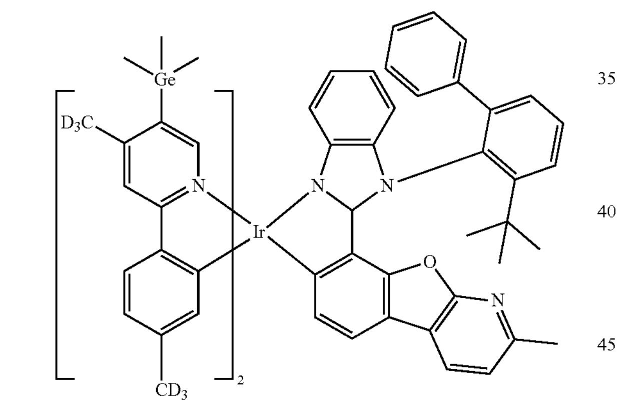
1304
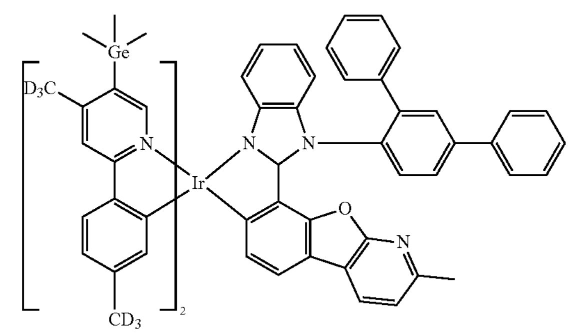
-continued
1305
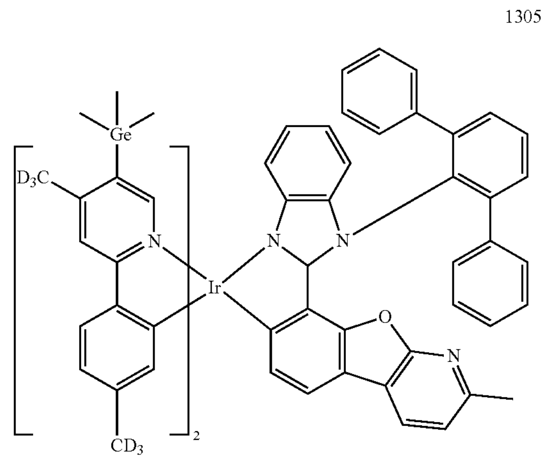
1306
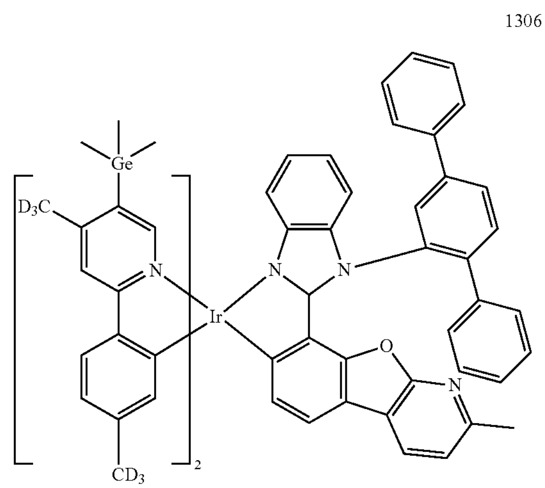
1307
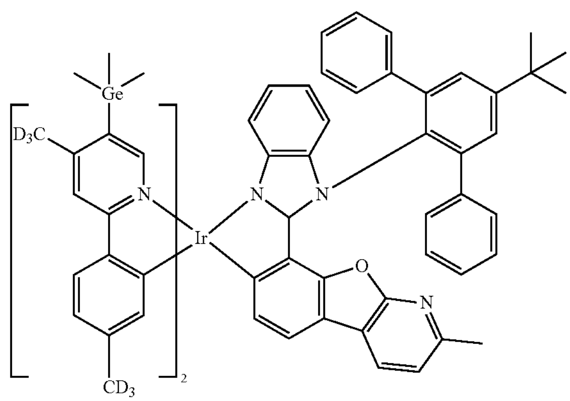

-continued
1308
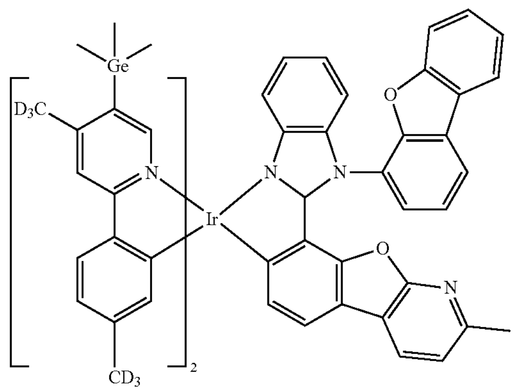
1309
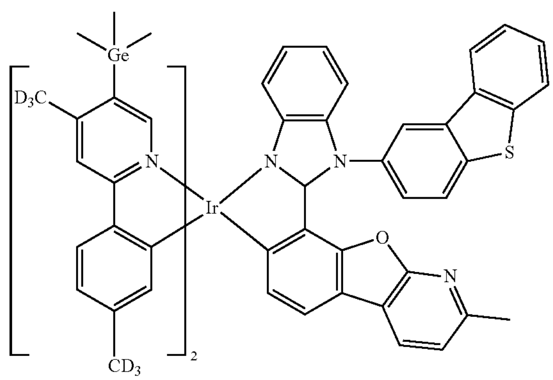
1310
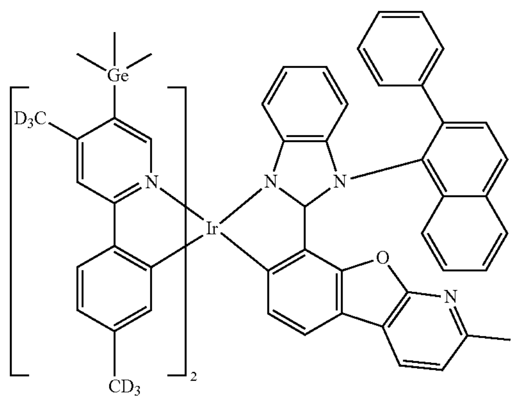
1311
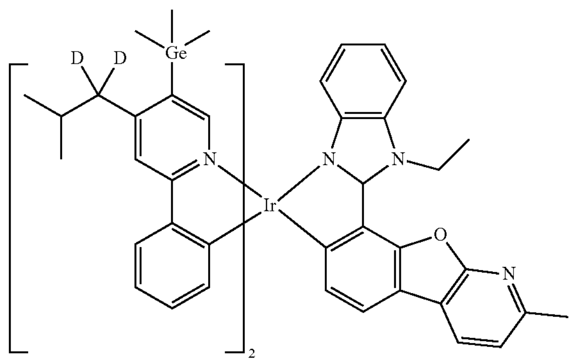
-continued
1312
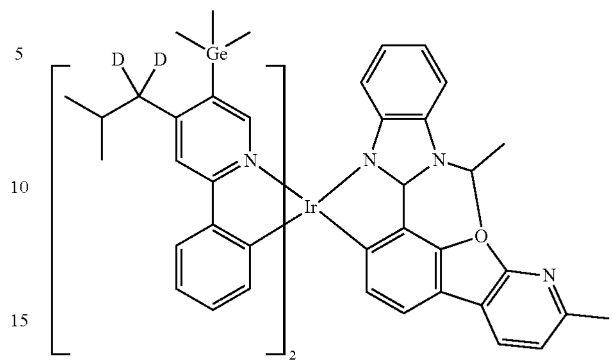
1313
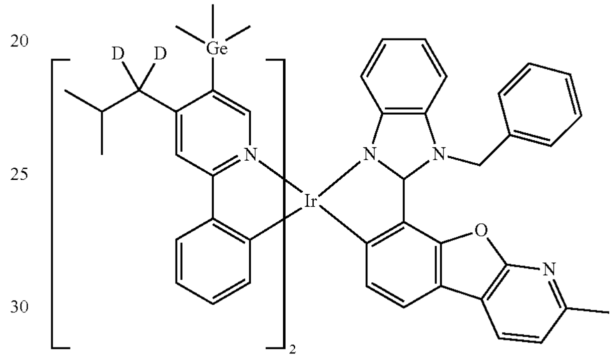
1314
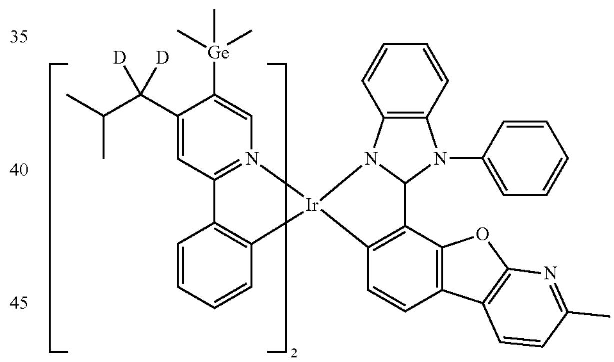
1315
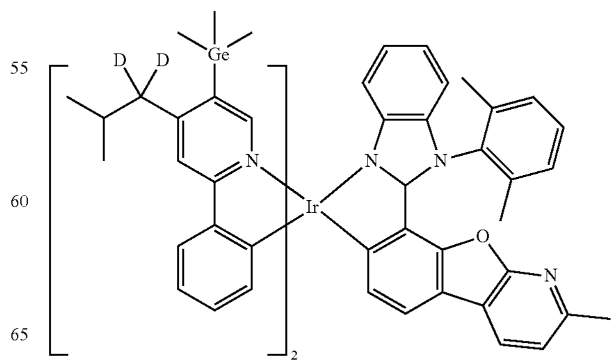

-continued
1316
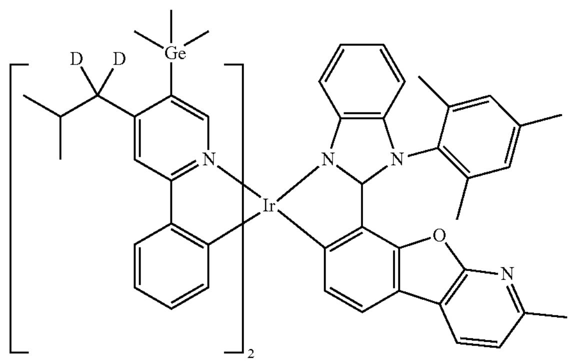
1317
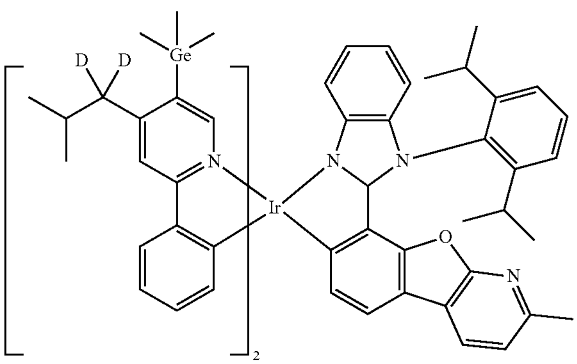
1318
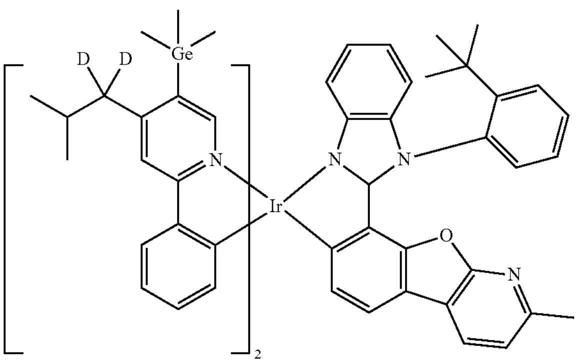
1319
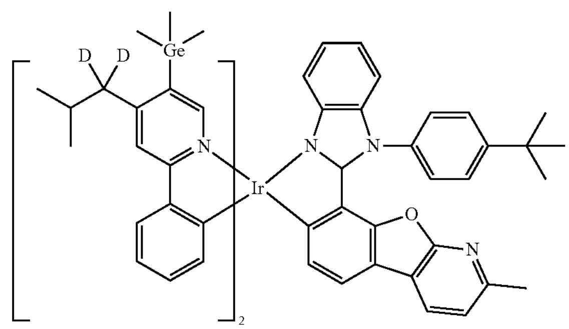
-continued
1320
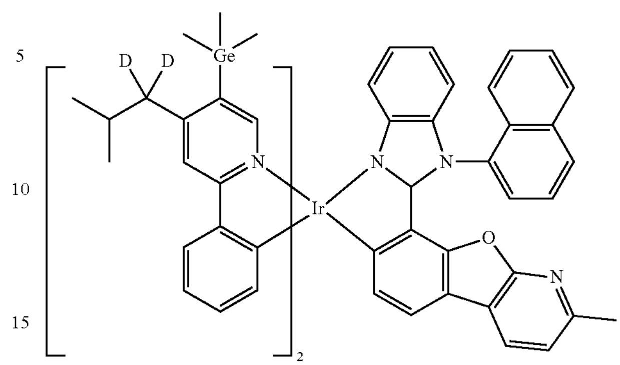
1321
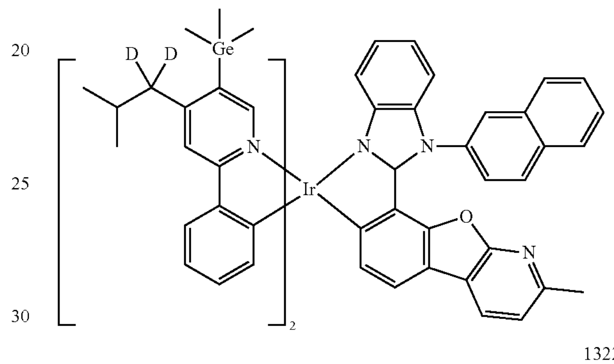
1322
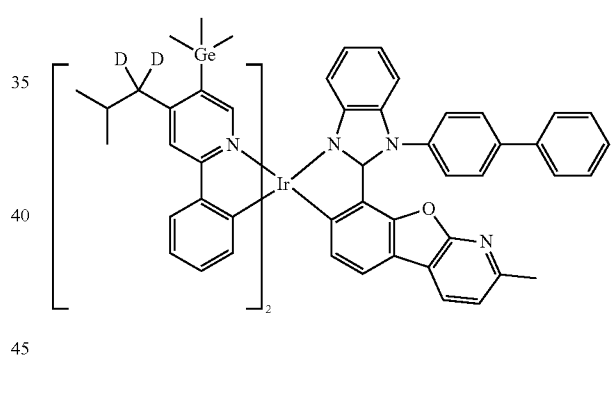
1323
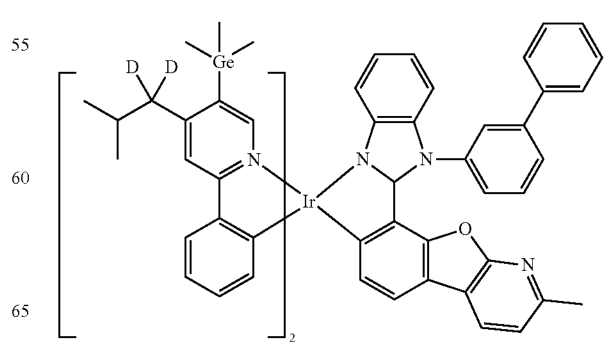

-continued
1324
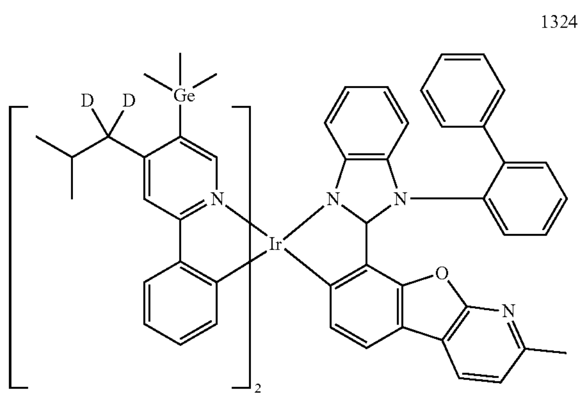
1325
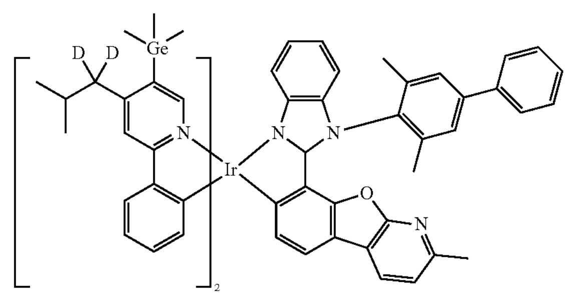
1326
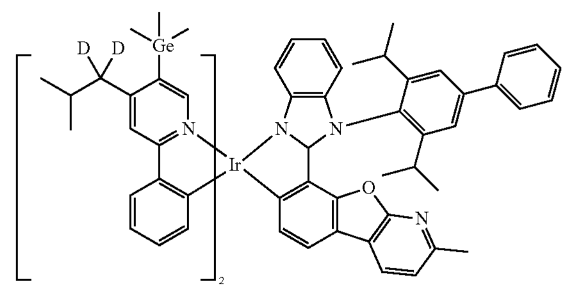
1327
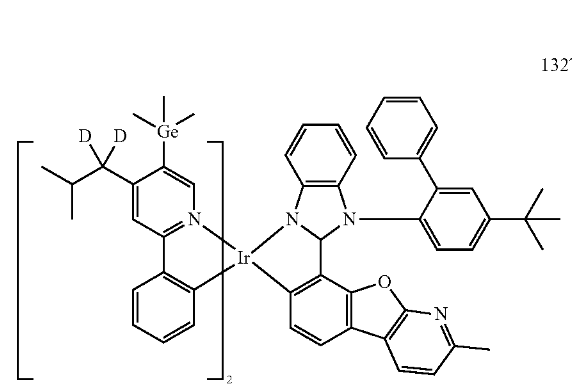
-continued
1328
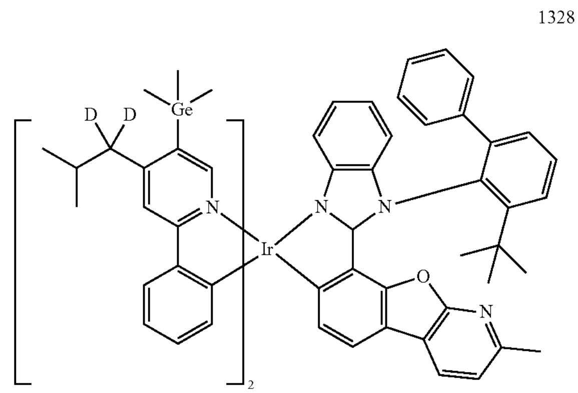
1329
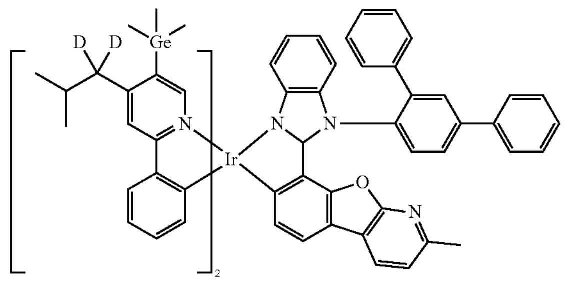
1330
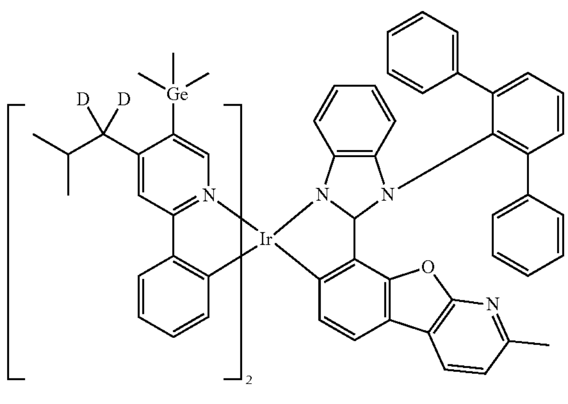
1331
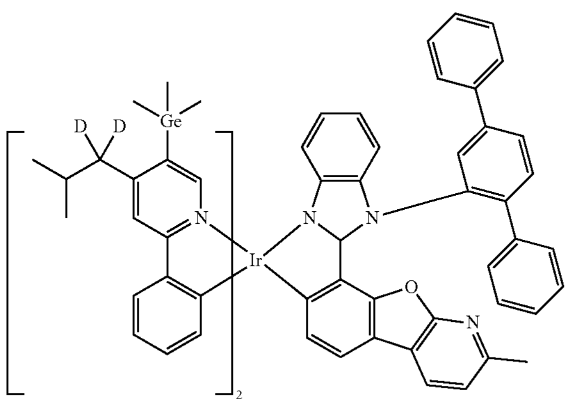

-continued
1332
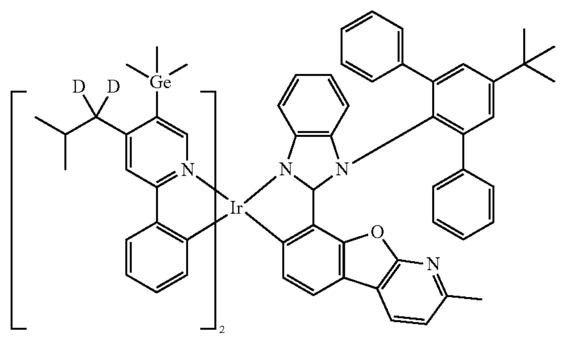
1333
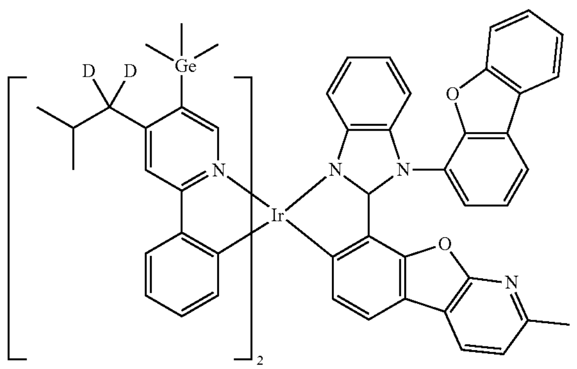
1334
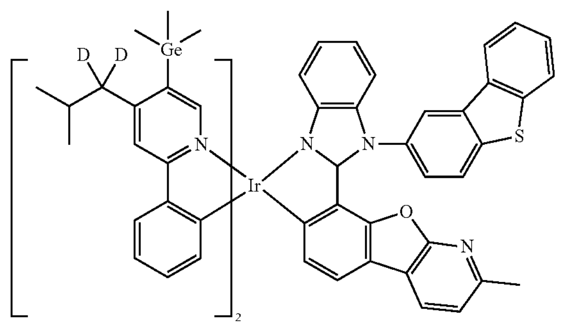
1335
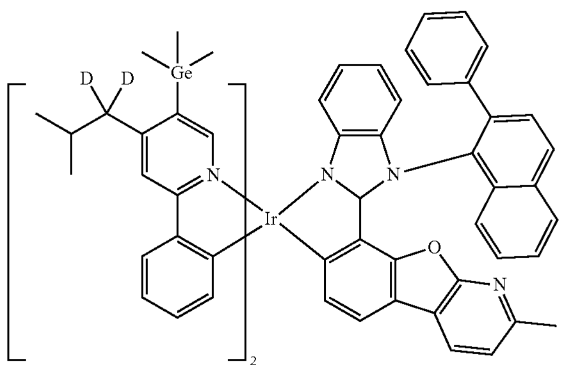
-continued
1336
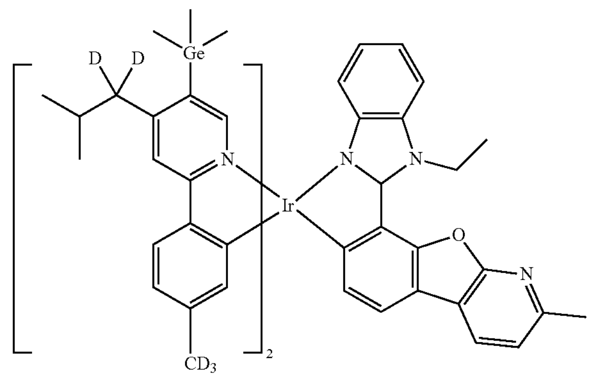
1337
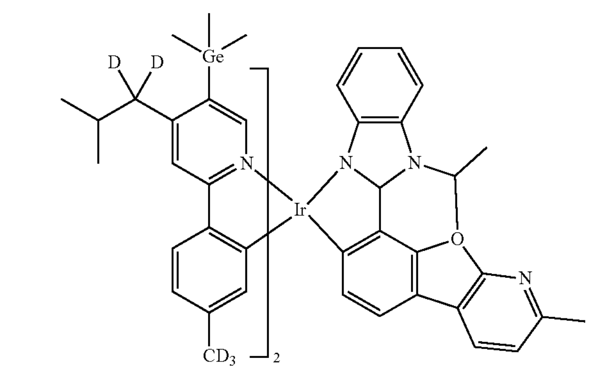
1338
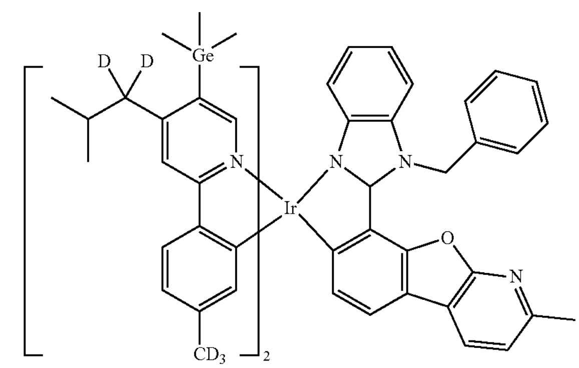
1339
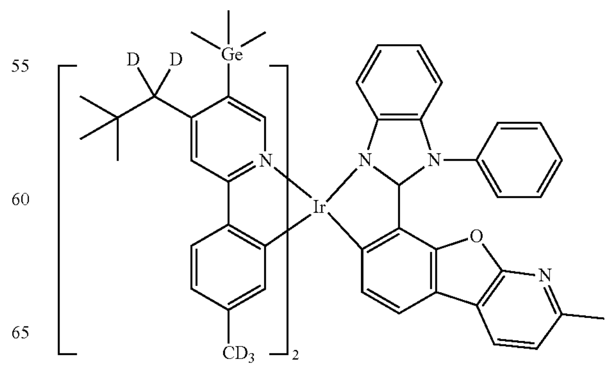

-continued
1340
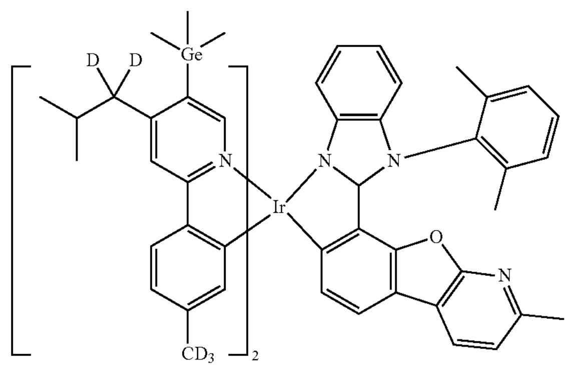
1341
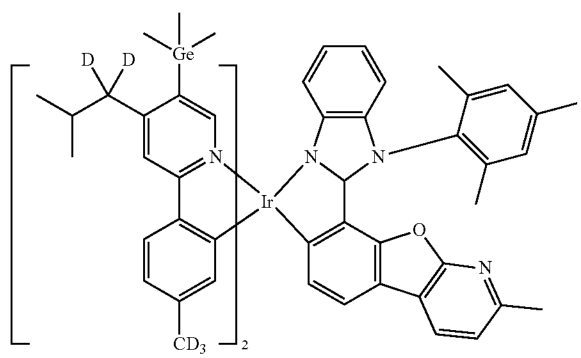
1342
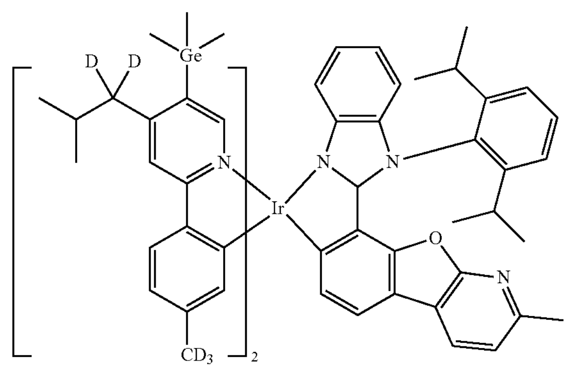
1343
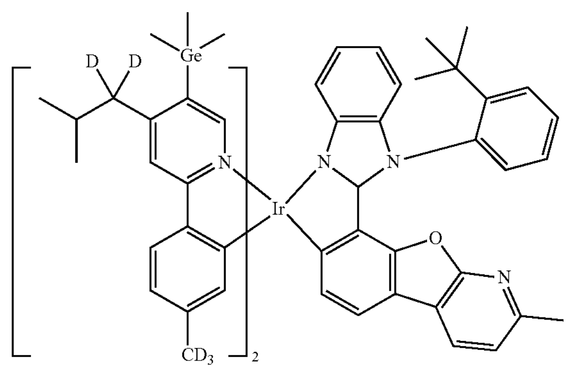
-continued
1344
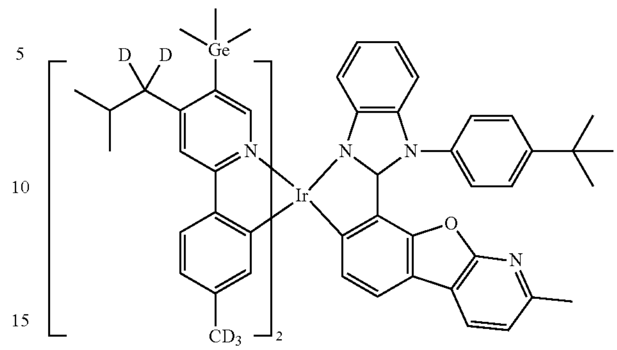
1345
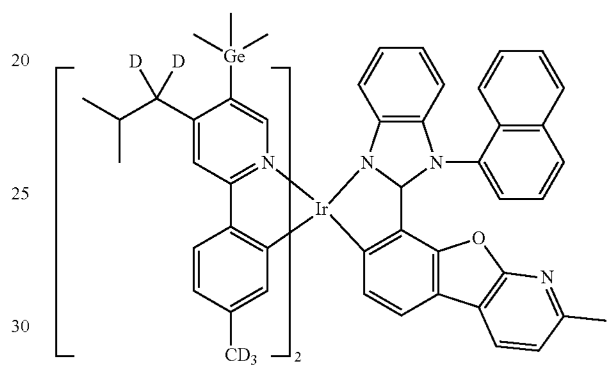
1346
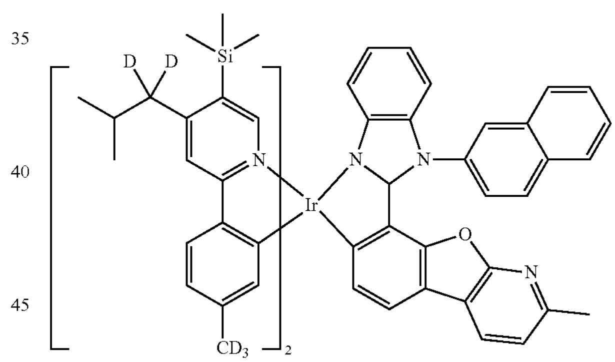
1347
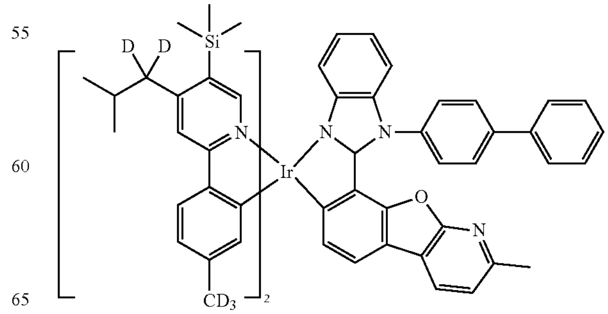

-continued
1348
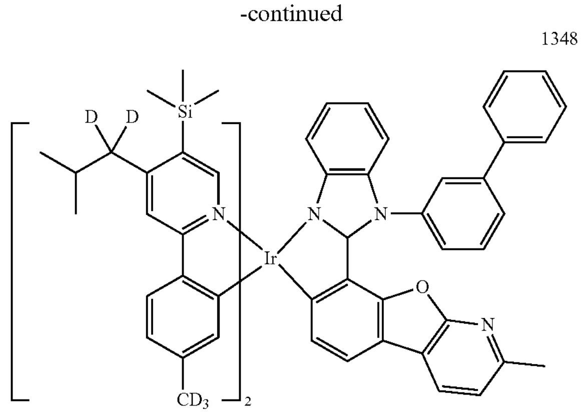
1349
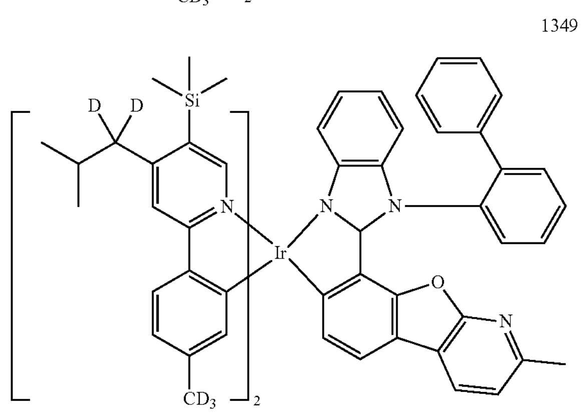
1350
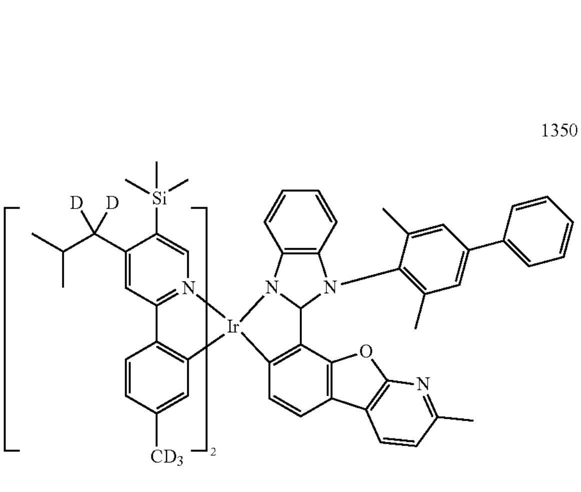
1351
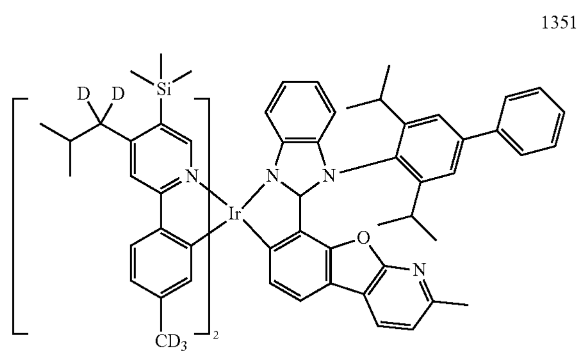
-continued
1352
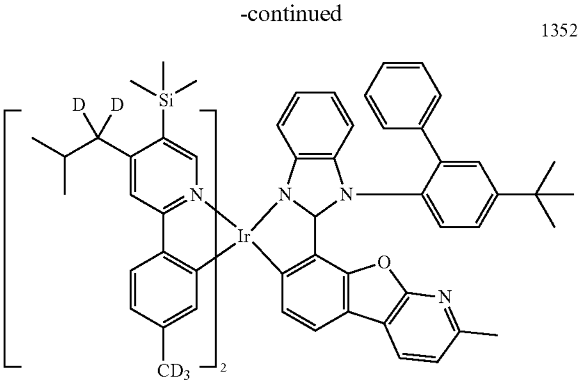
1353
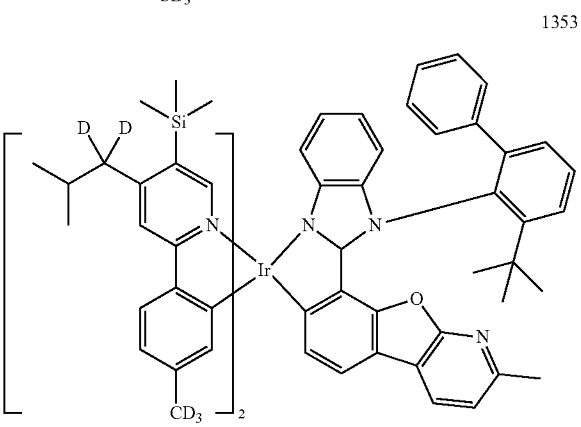
1354
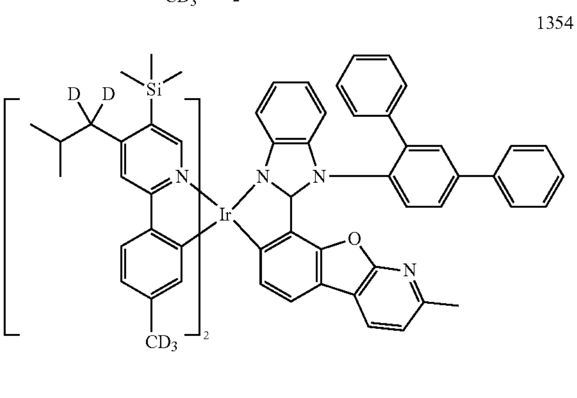
1355
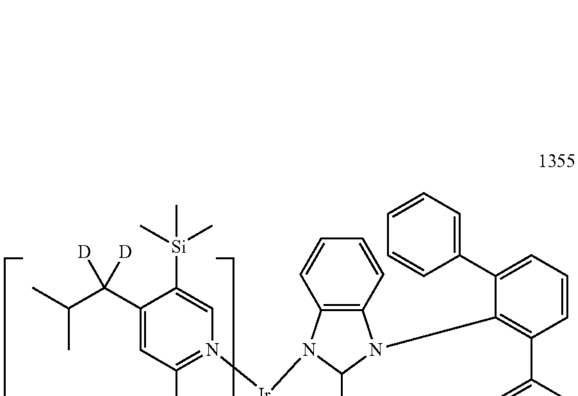
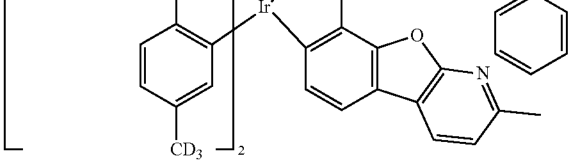

-continued
1356
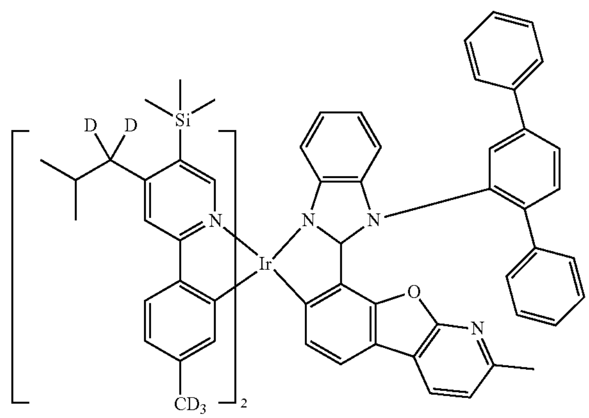
1357
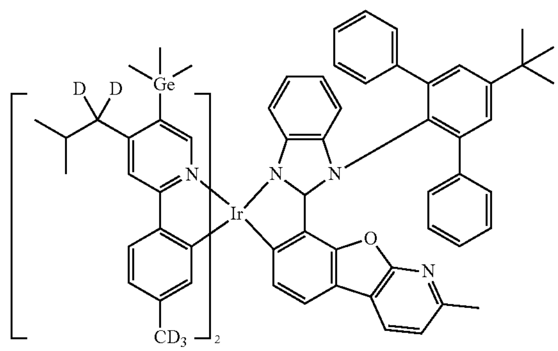
1358
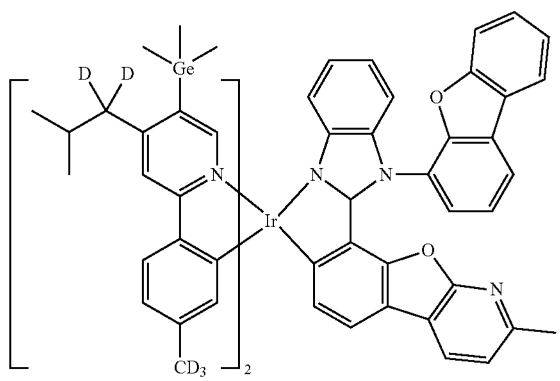
1359
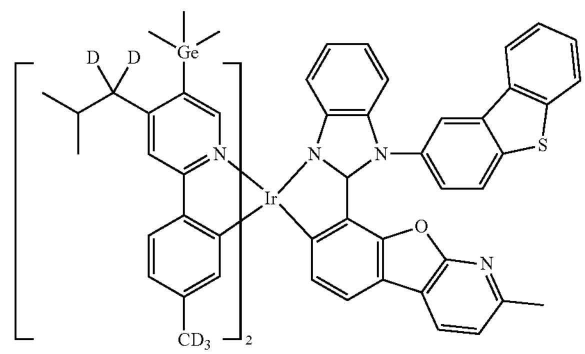
-continued
1360
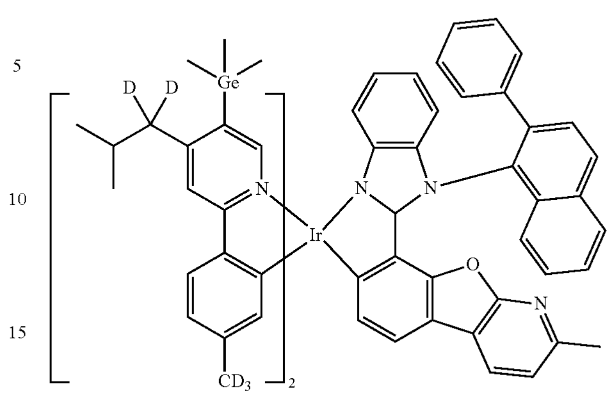
1361
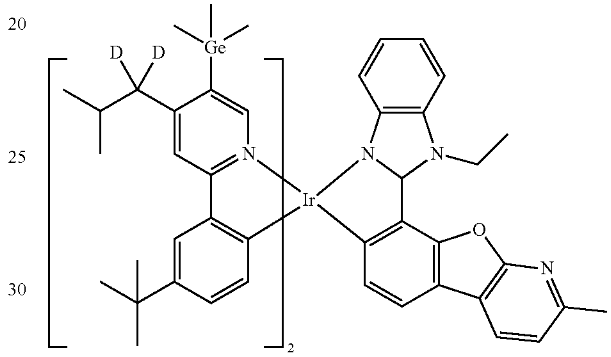
1362
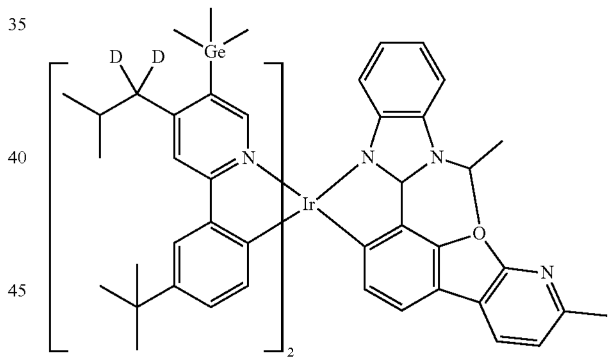
1363
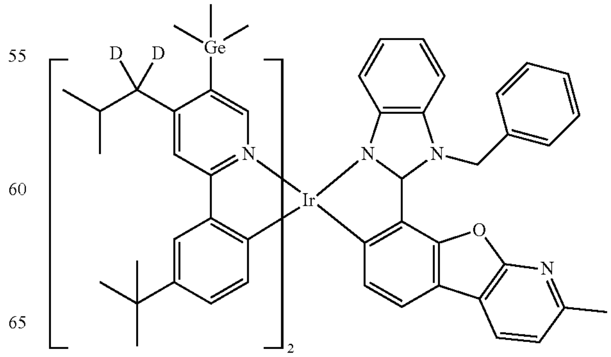

-continued
1364
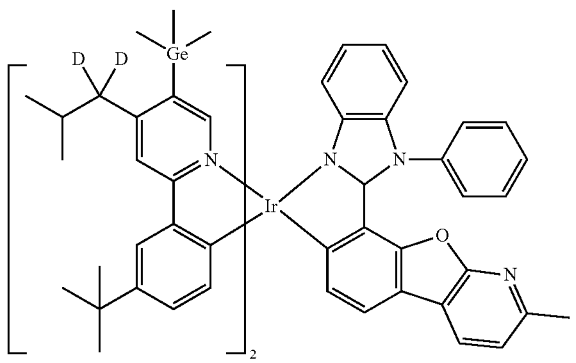
1365
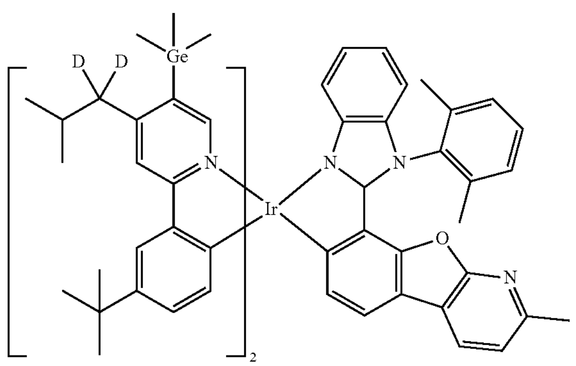
1366
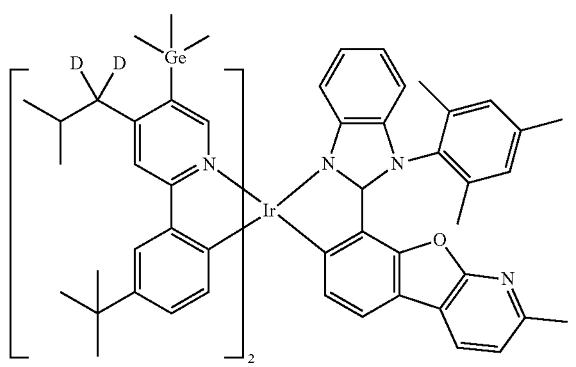
1367
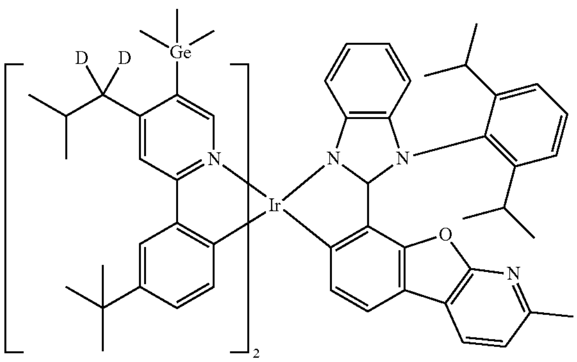
-continued
1368
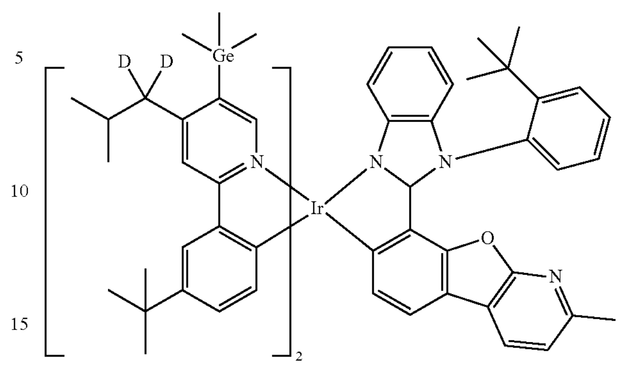
1369
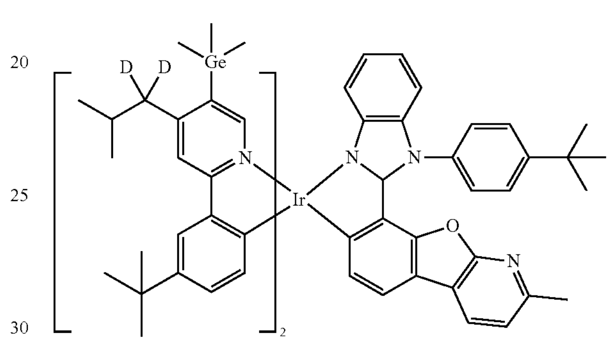
1370
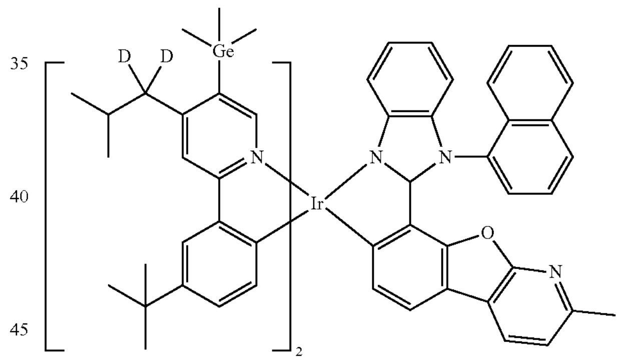
1371
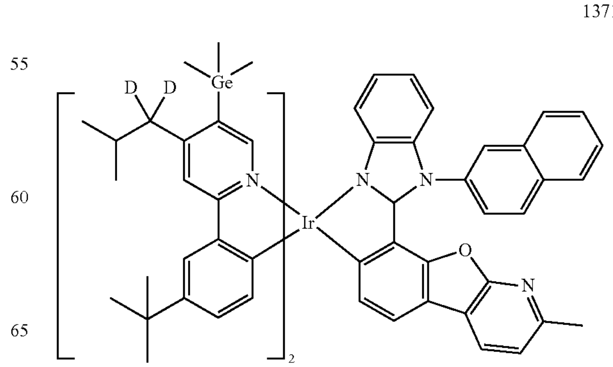

-continued
1372
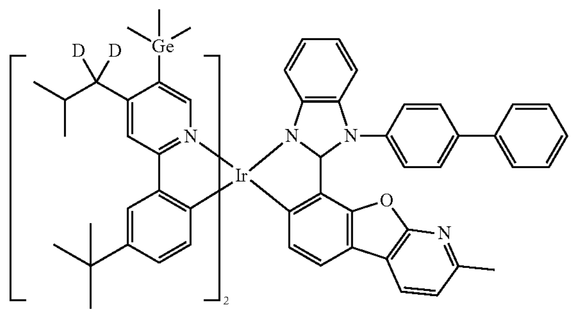
1373
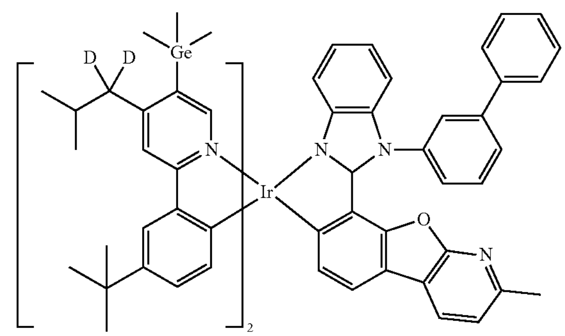
1374
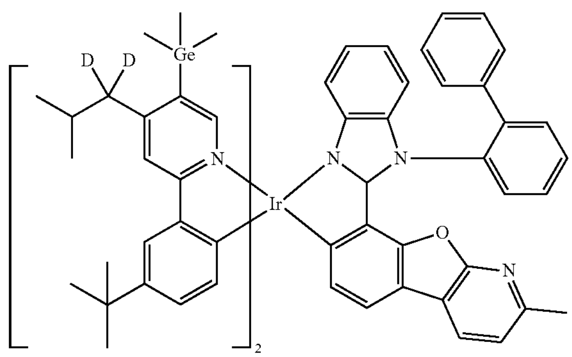
1375
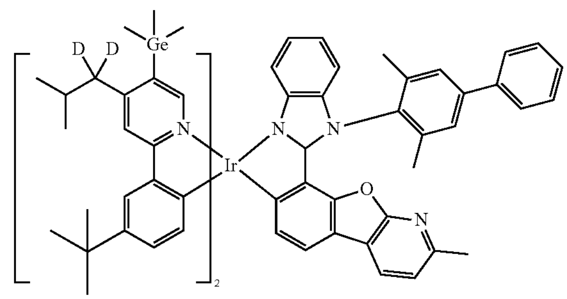
-continued
1376
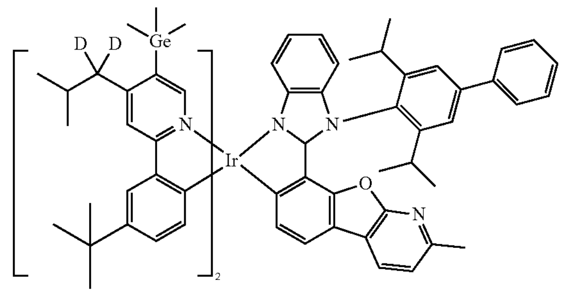
1377
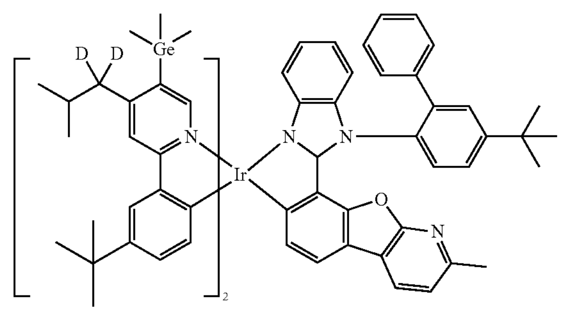
1378
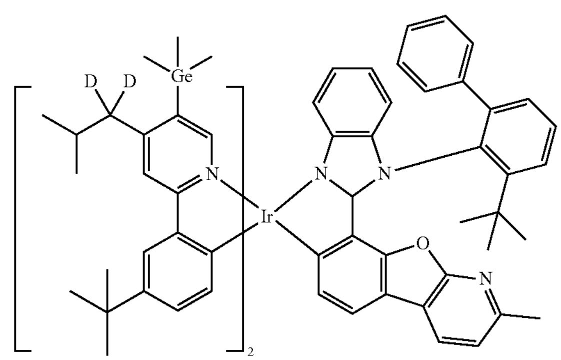
1379
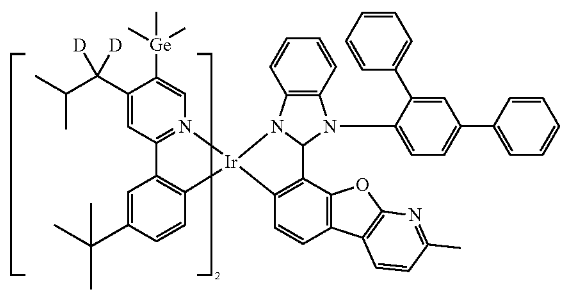

-continued
1380
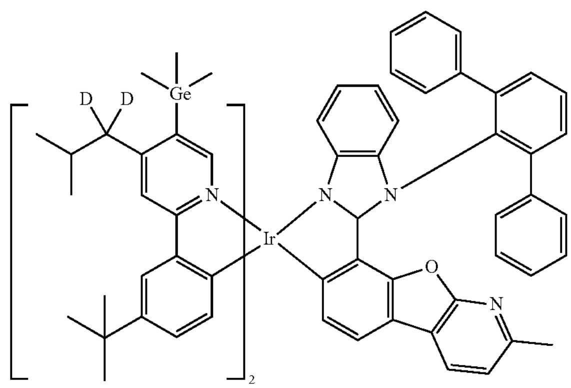
1381
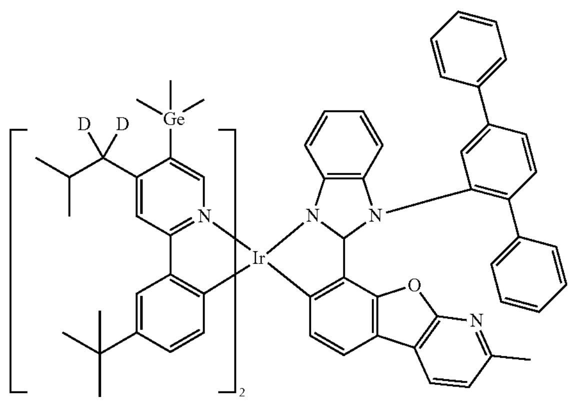
1382
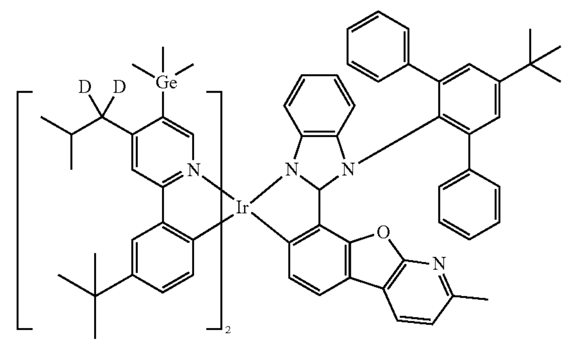
1383
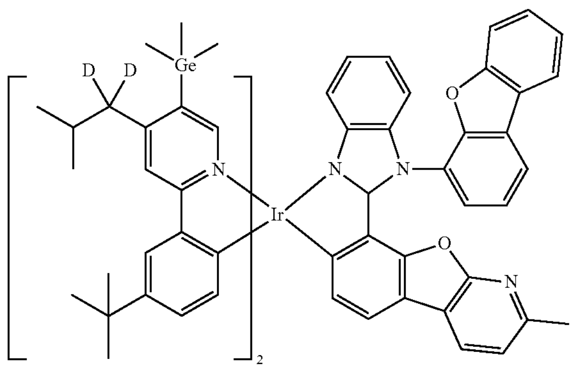
-continued
1384
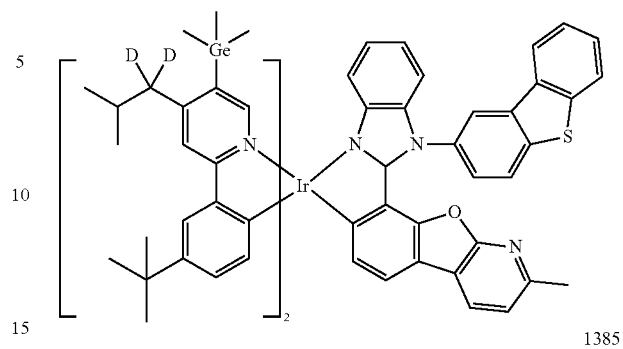
1385
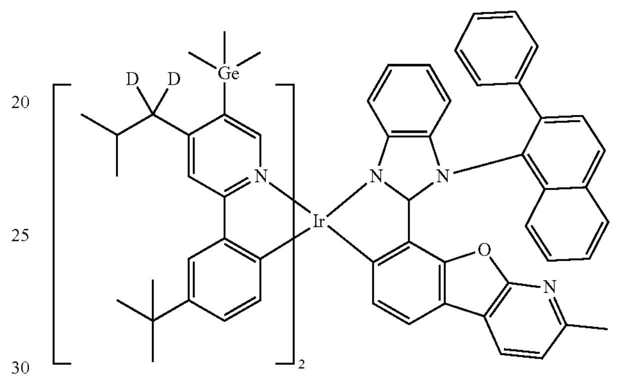
1386
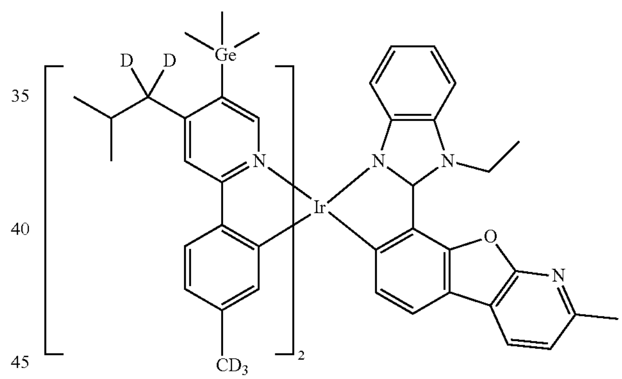
1387
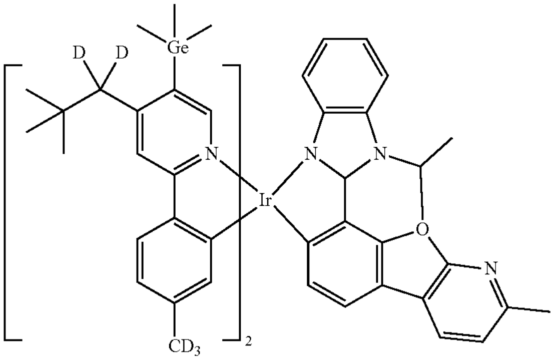

-continued
1388
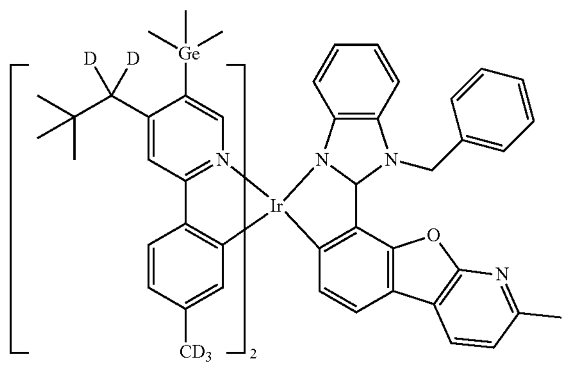
1389
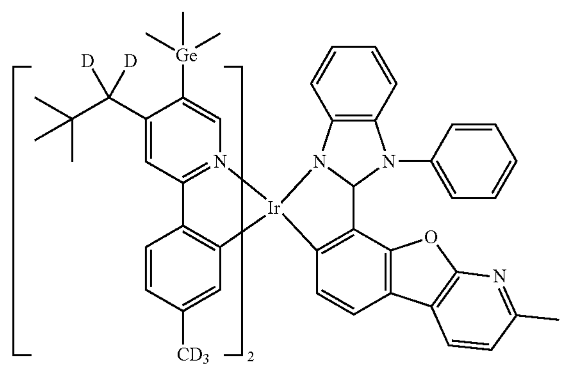
1390
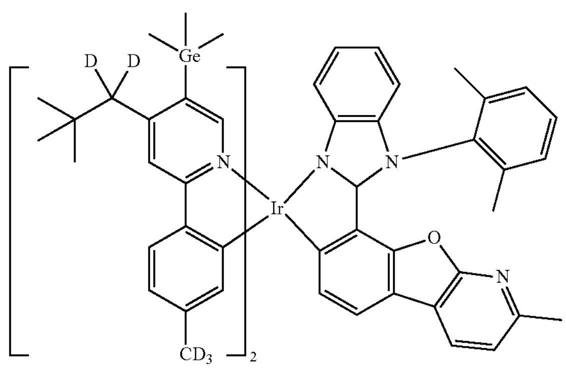
1391
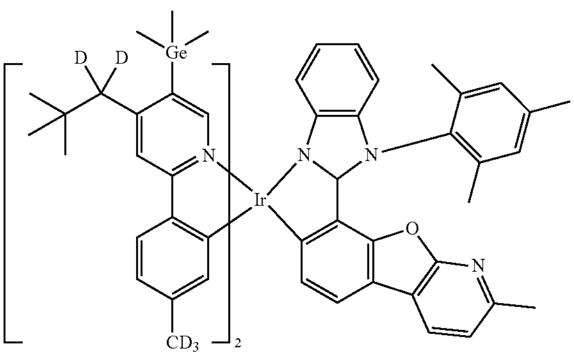
-continued
1392
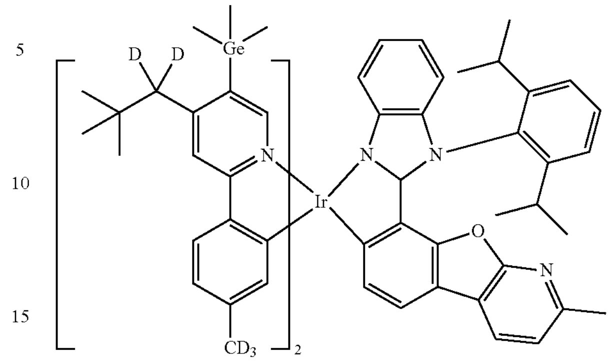
1393
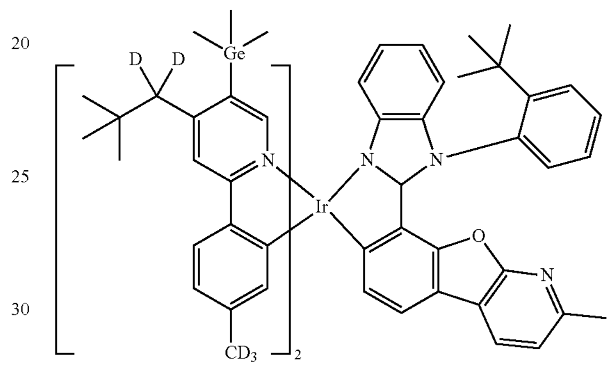
1394
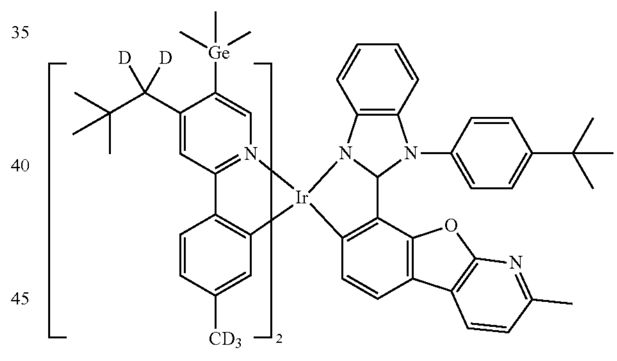
1395
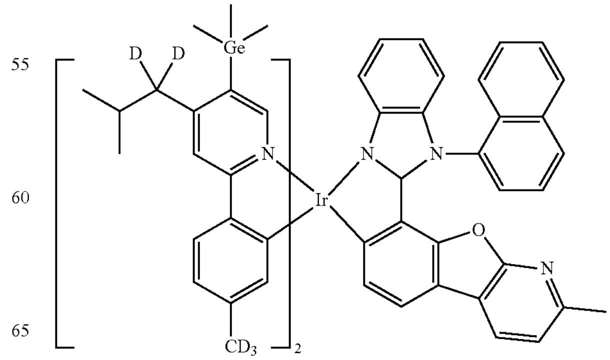

-continued
1396
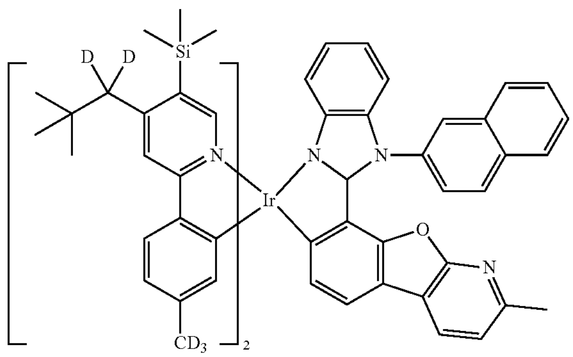
1397
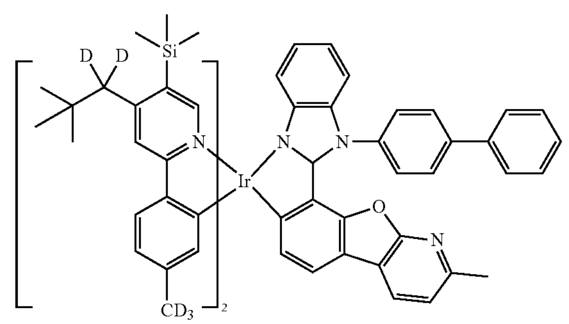
1398
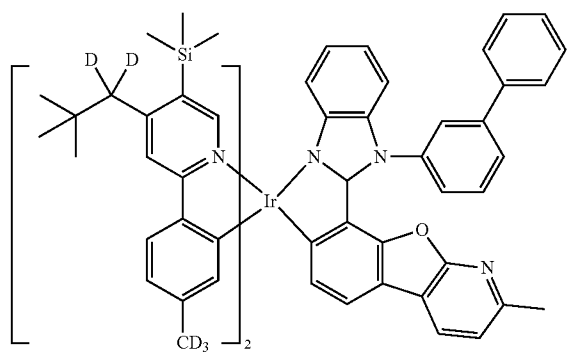
1399
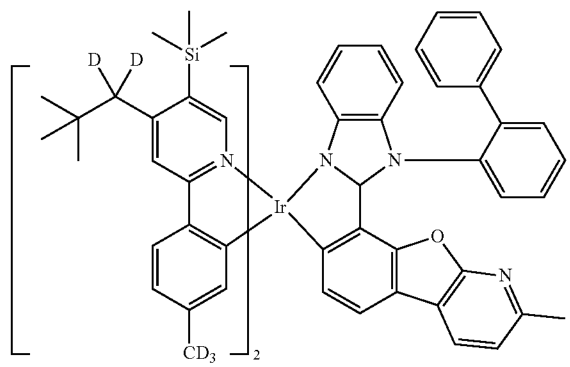
-continued
1400
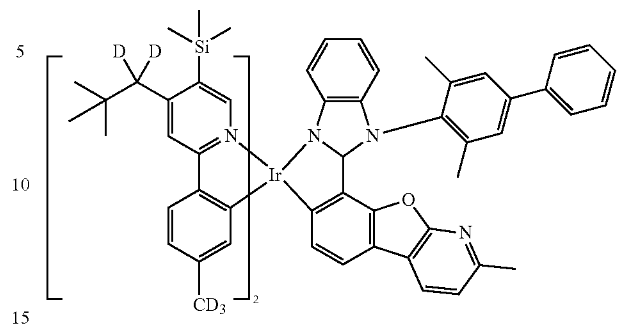
1401
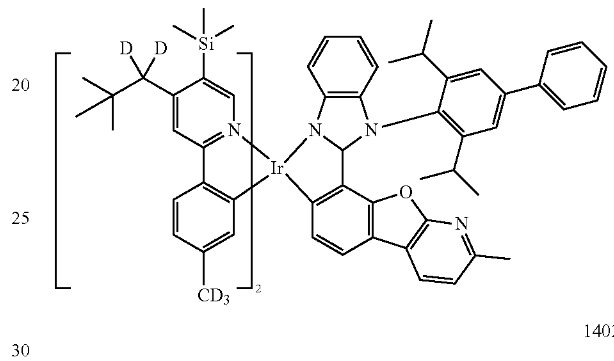
1402
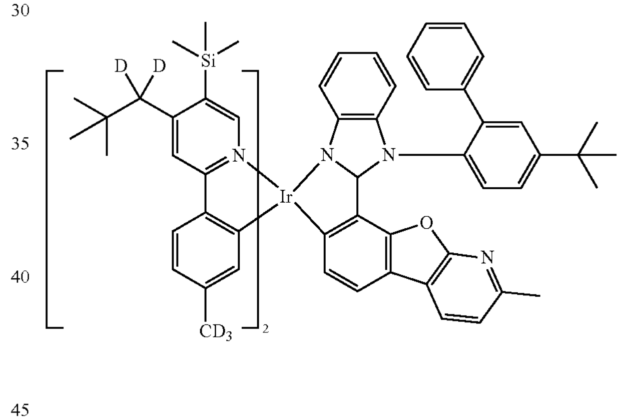
1403
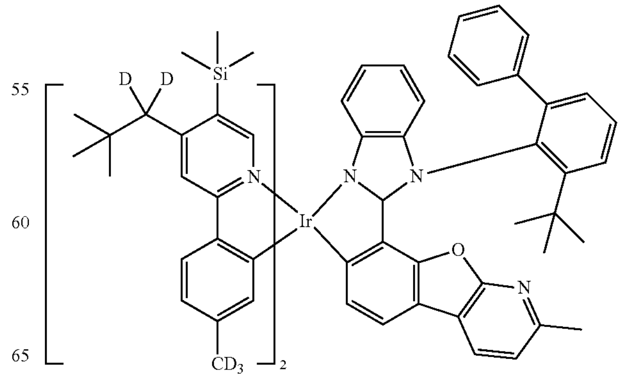

-continued
1404
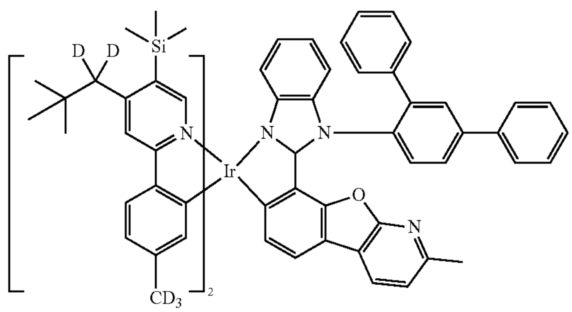
1405
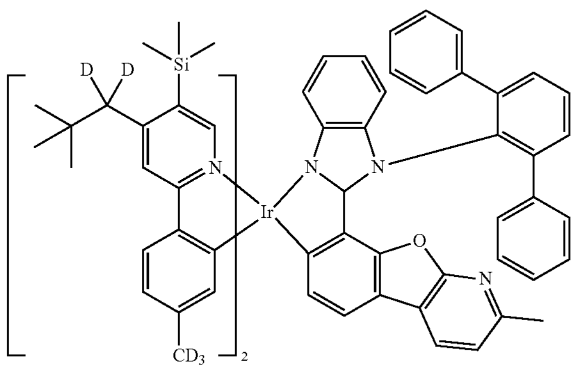
1406
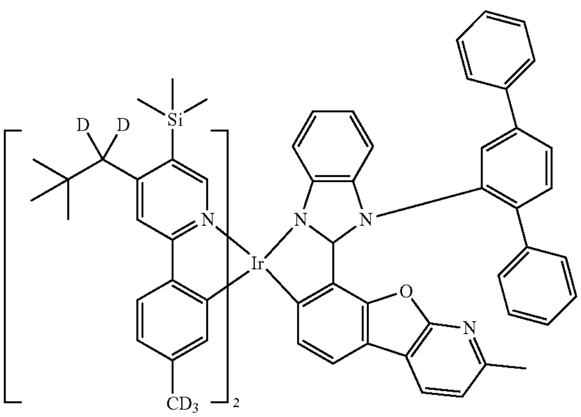
1407
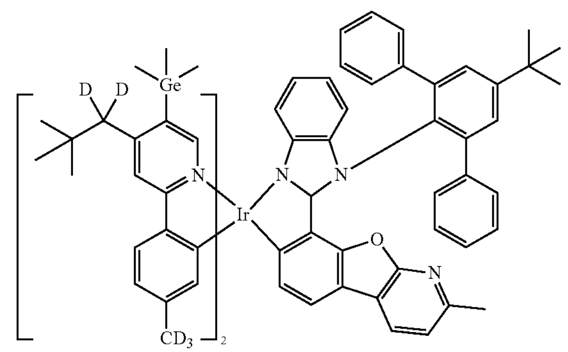
-continued
1408
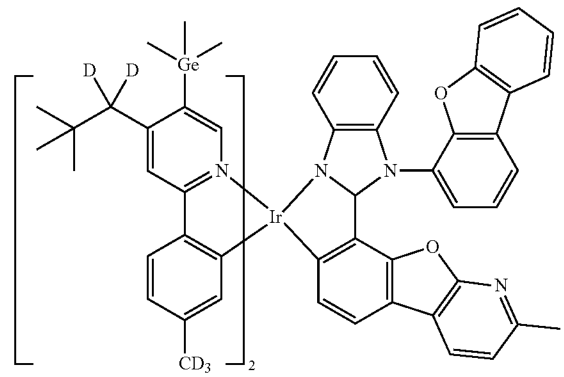
1409
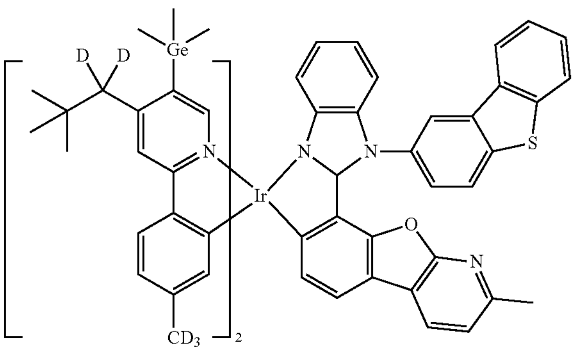
1410
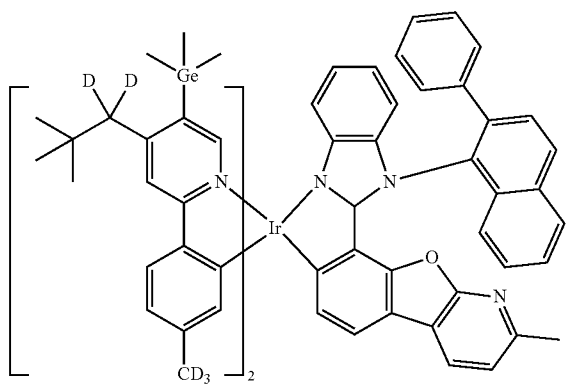
1411
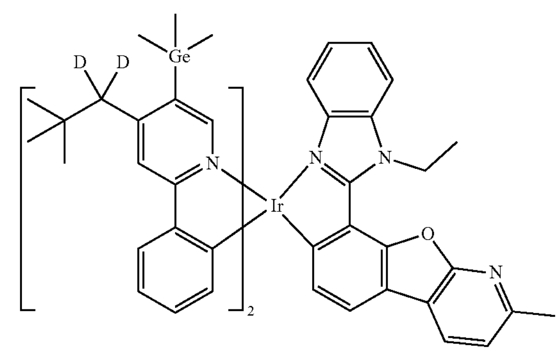

1412
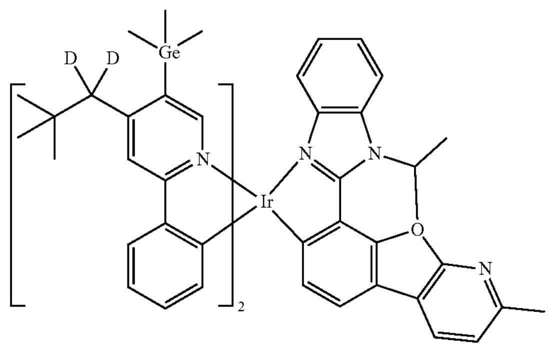
1413
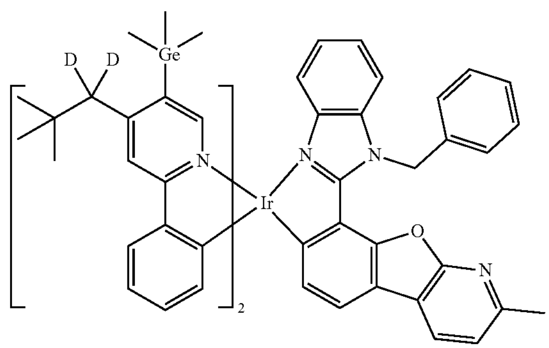
1414
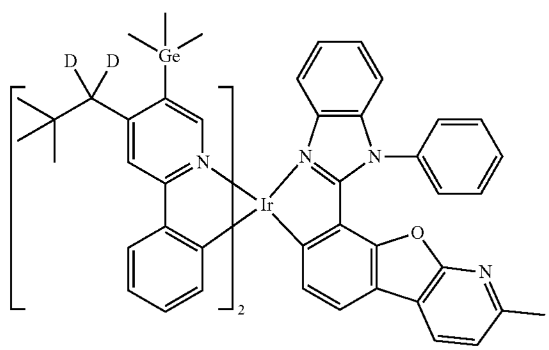
1415
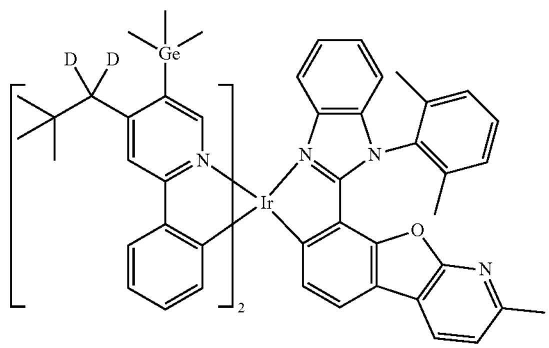
1416
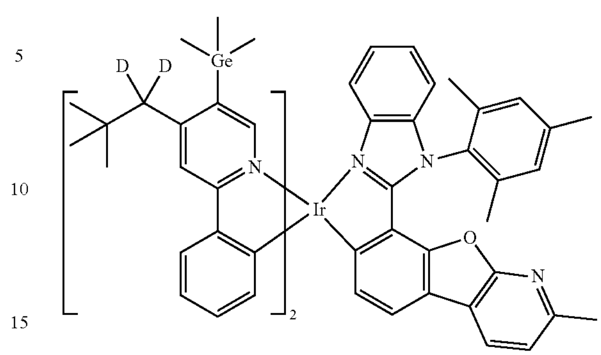
1417
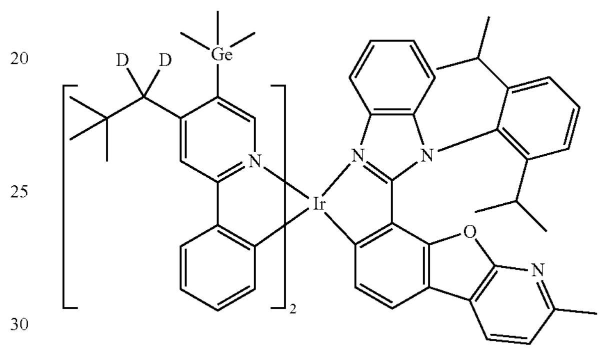
1418
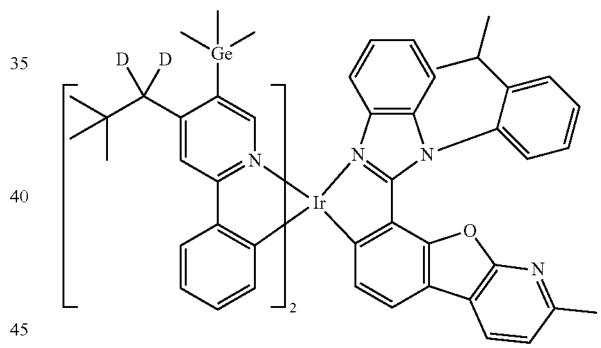
1419
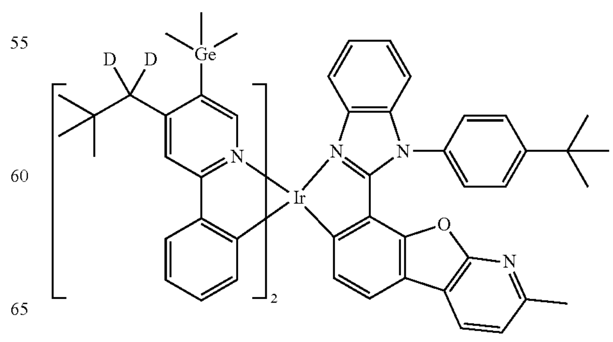

-continued
1420
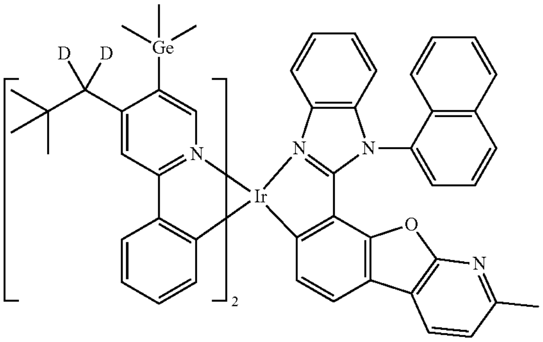
1421
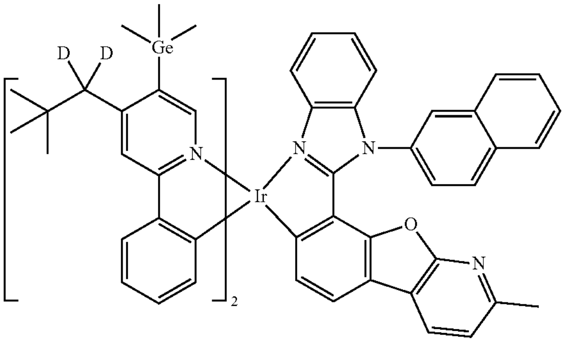
1422
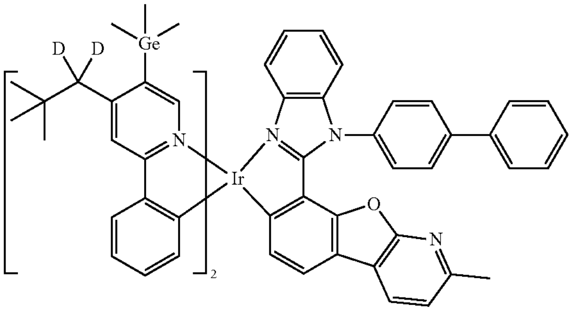
1423
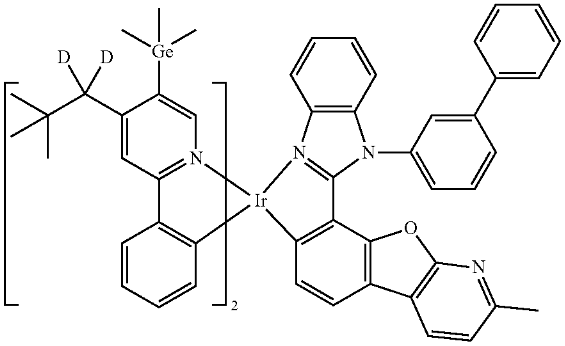
-continued
1424
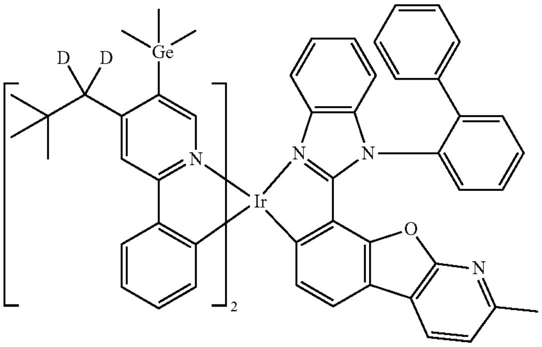
1425
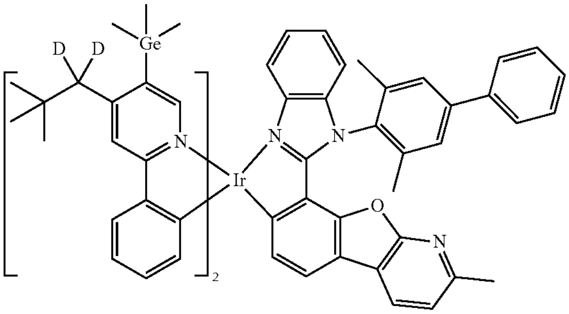
1426
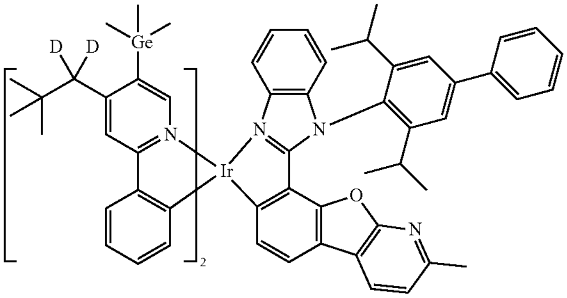
1427
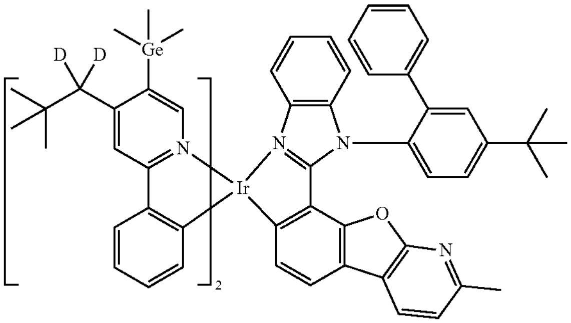

-continued
1428
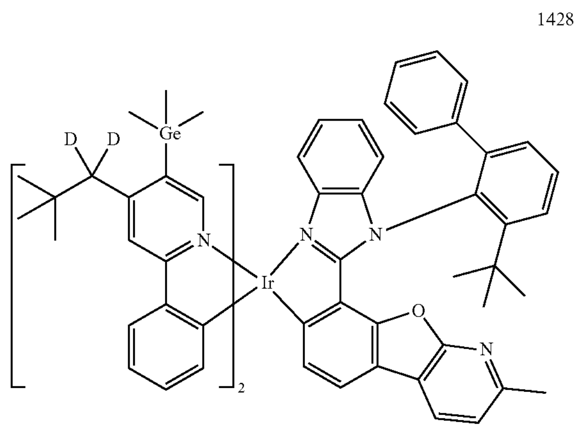
1429
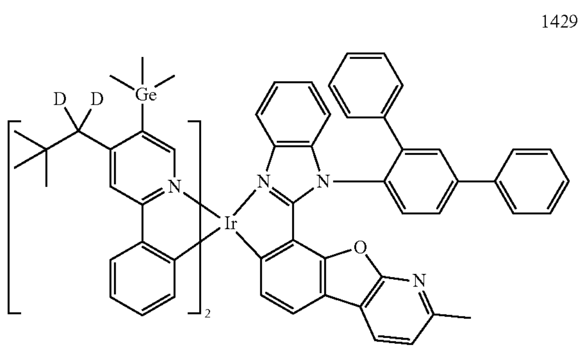
1430
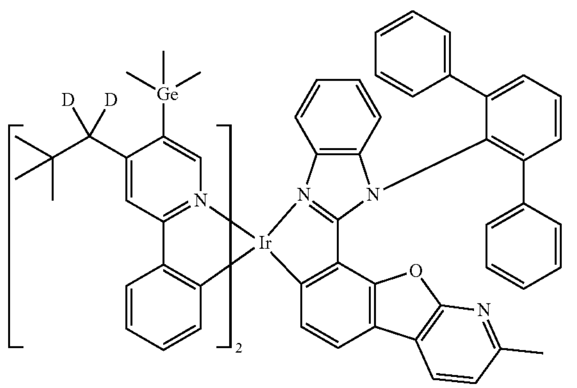
1431
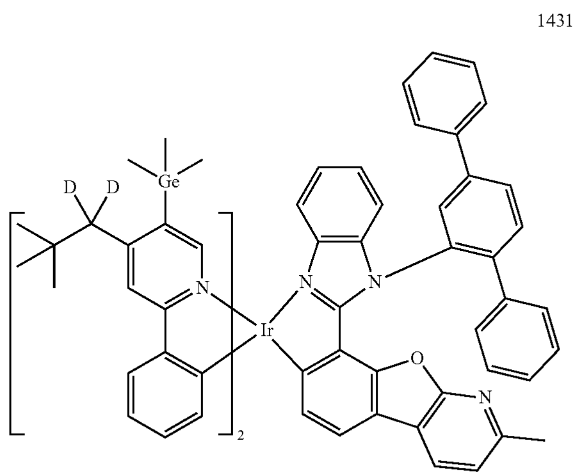
-continued
1432
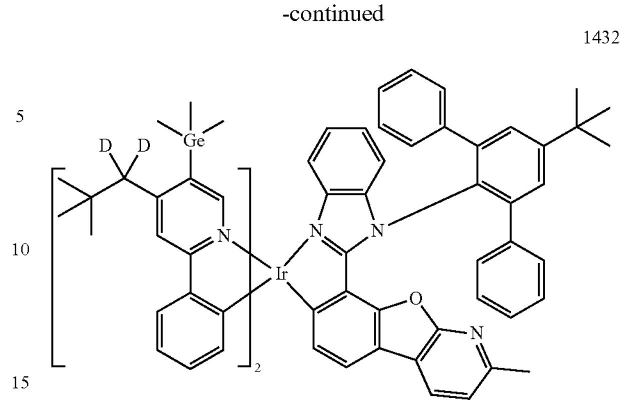
1433
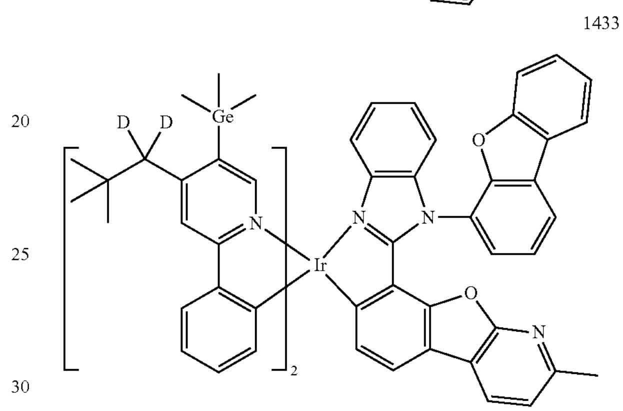
1434
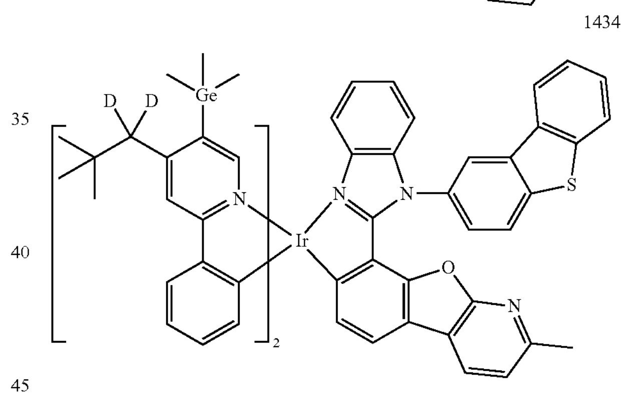
1435
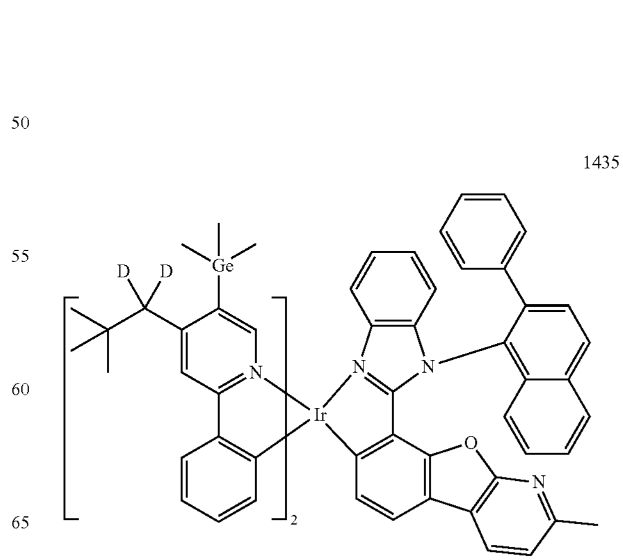

-continued
1436
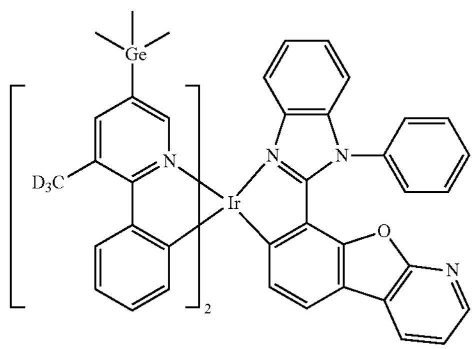
1437
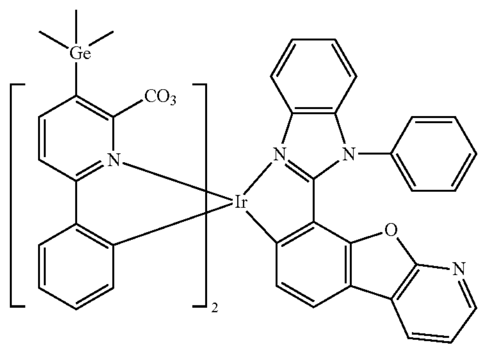
1438
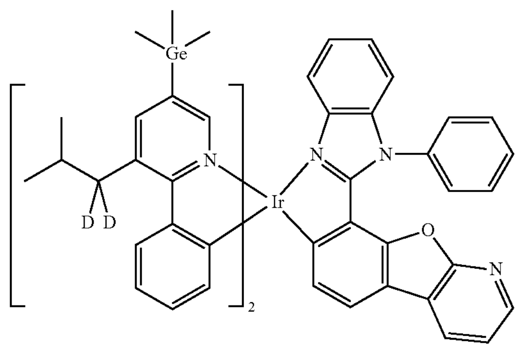
1439
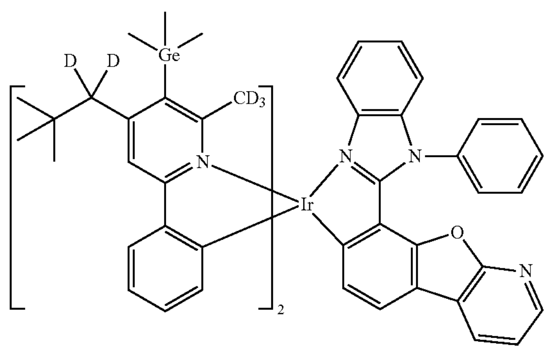
-continued
1440
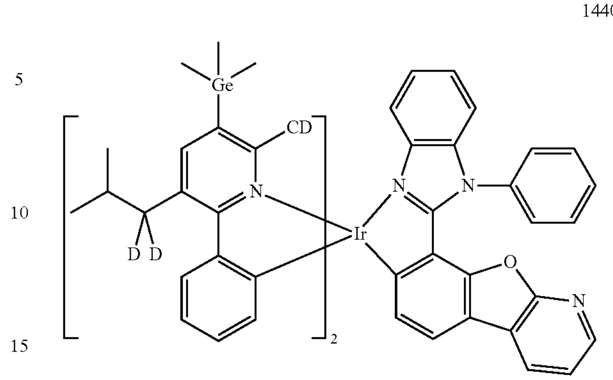
1441
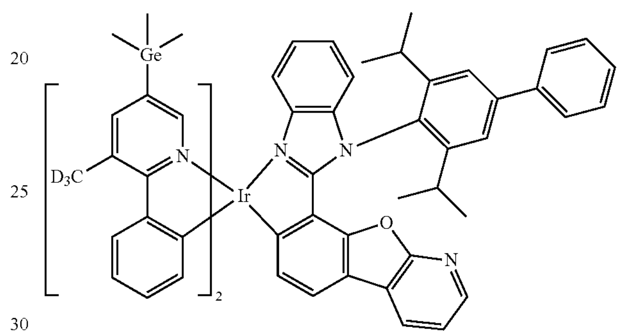
1442
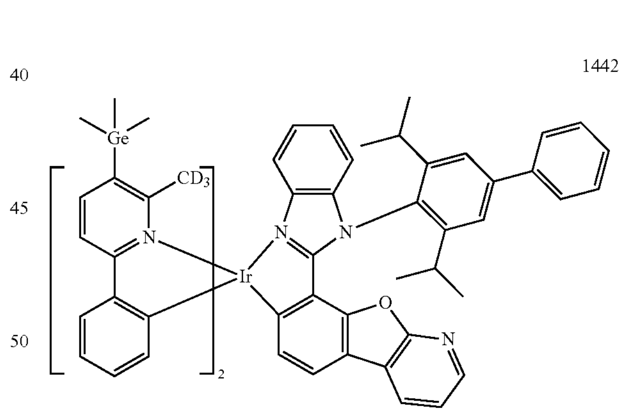
1443
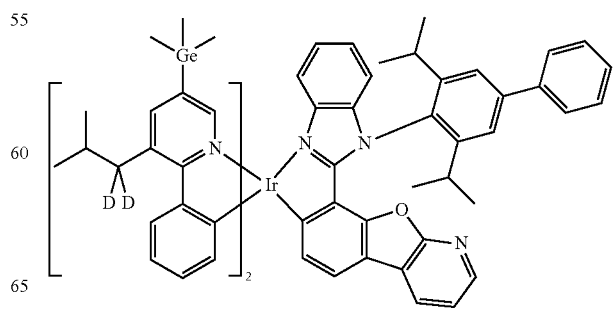

-continued
1444
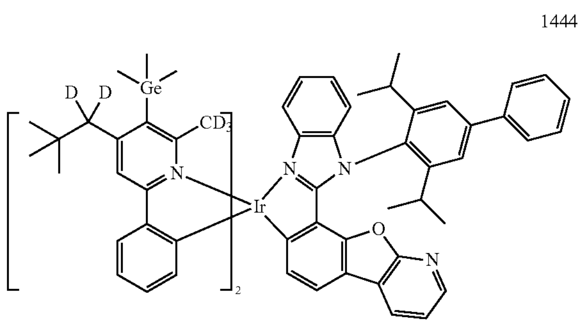
1445
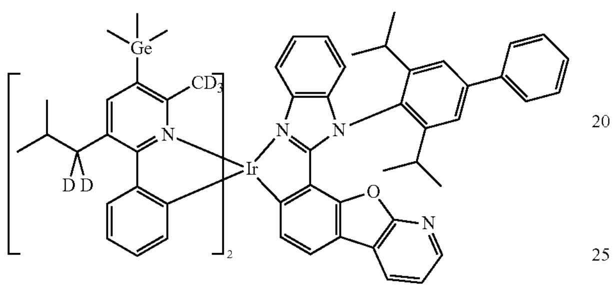
1446
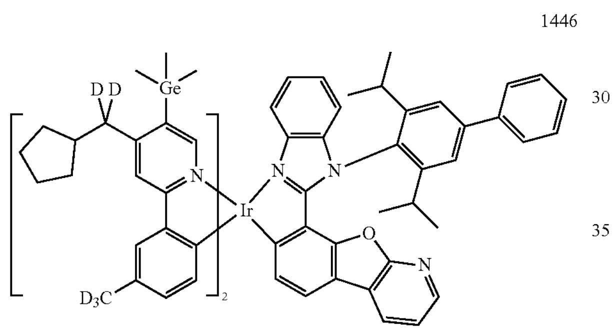
1447
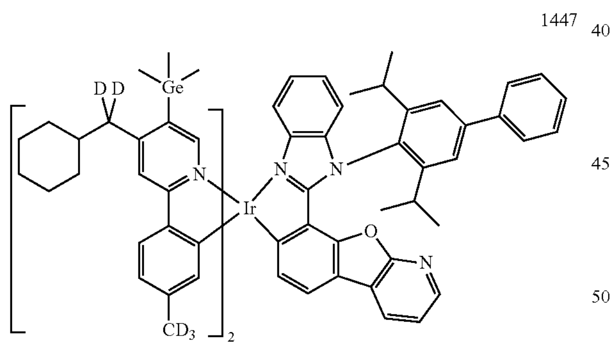
1448
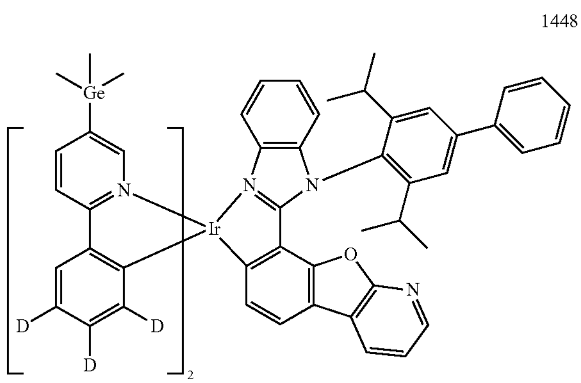
-continued
1449
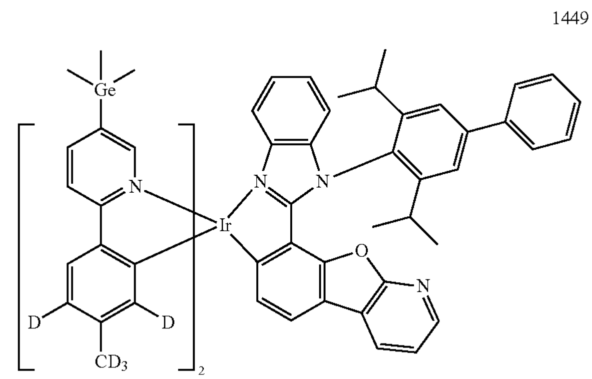
1450
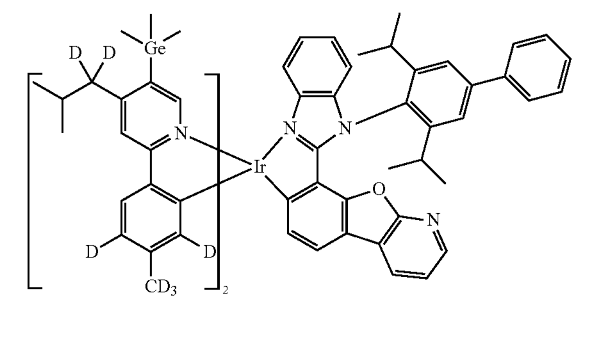
1451
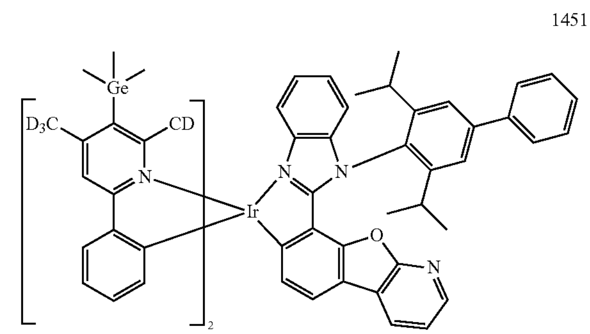
1452
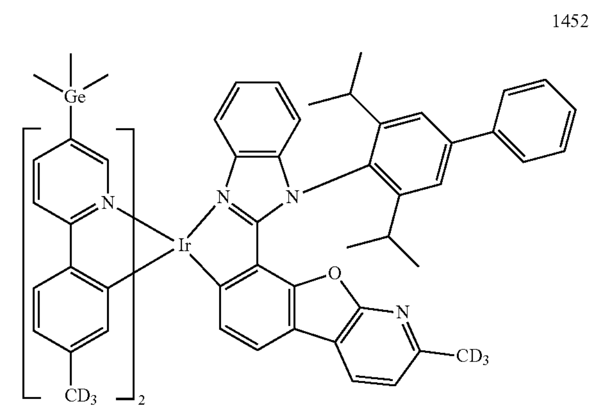

-continued
1453
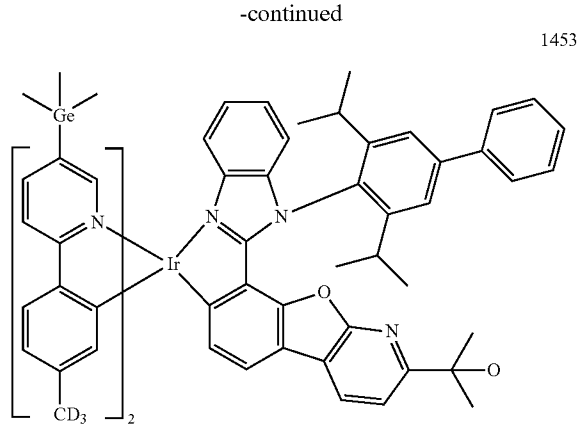
1454
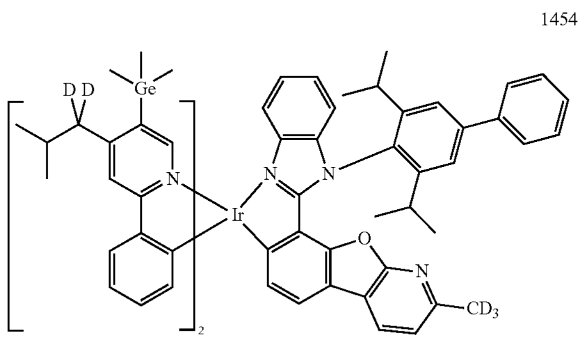
1455
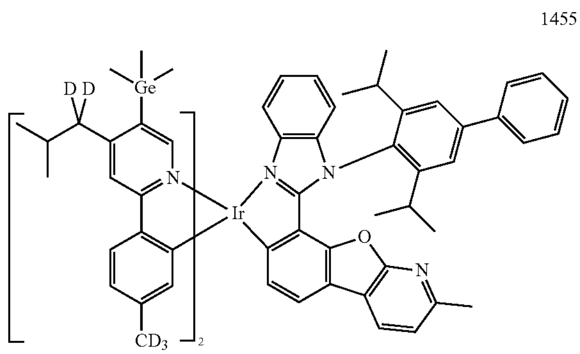
1457
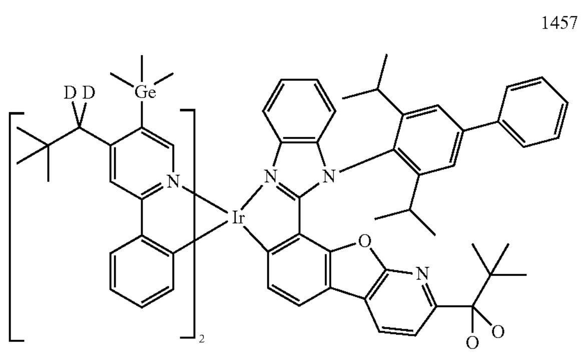
-continued
1458
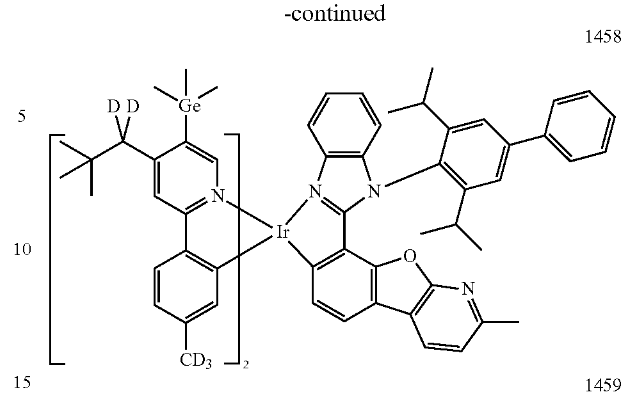
1459
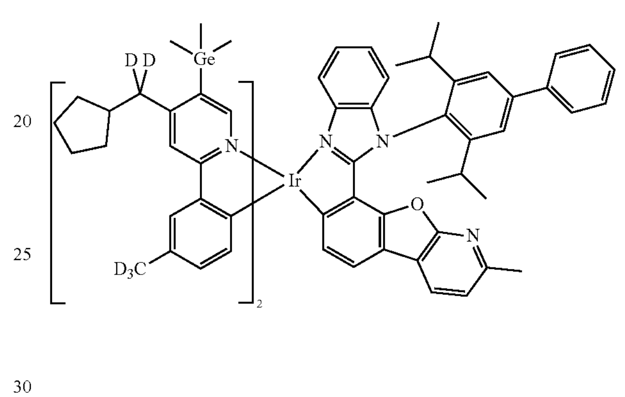
1460
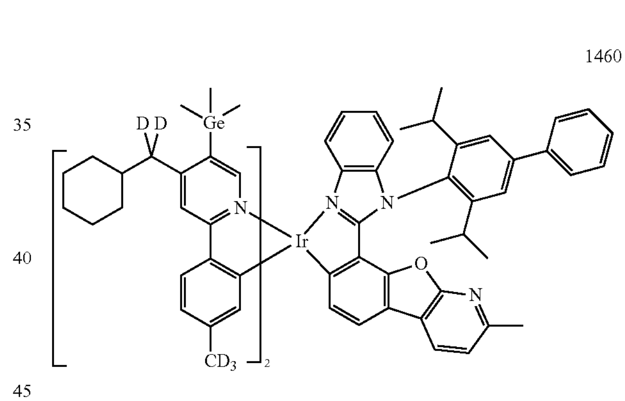
1461
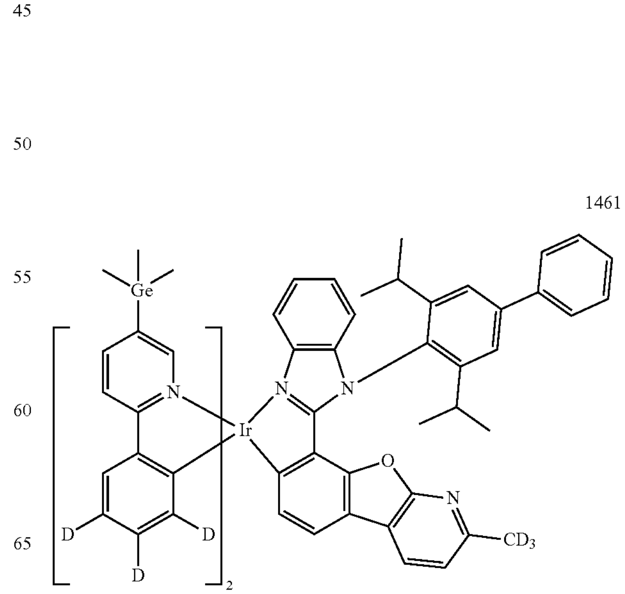

-continued
1462
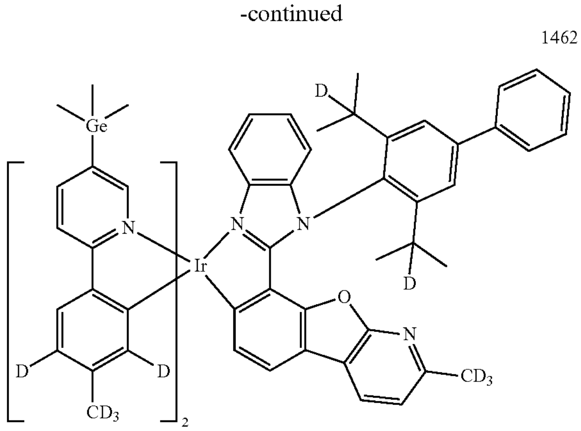
1463
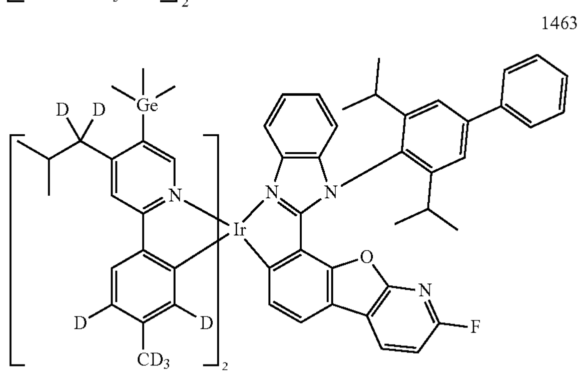
1464
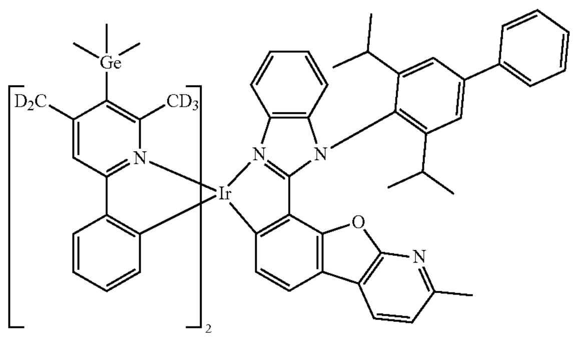
1465
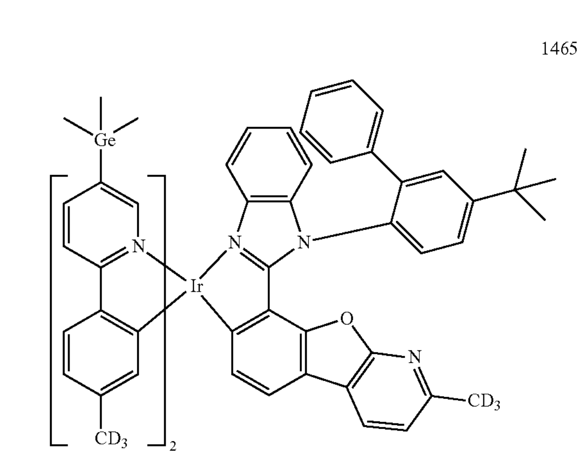
-continued
1466
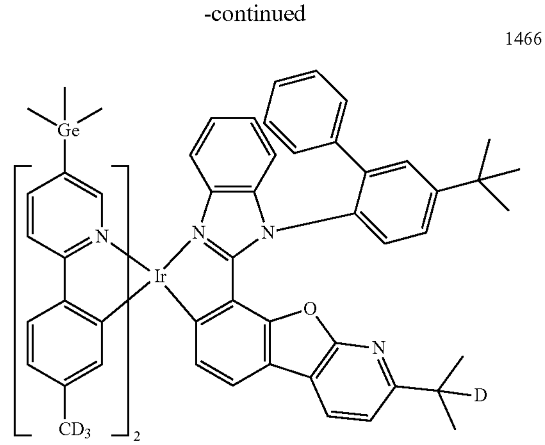
1467
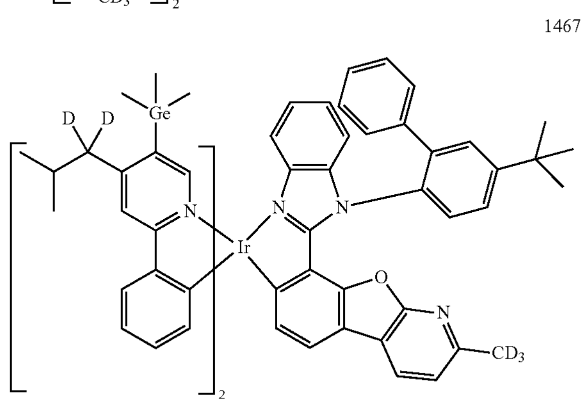
1468
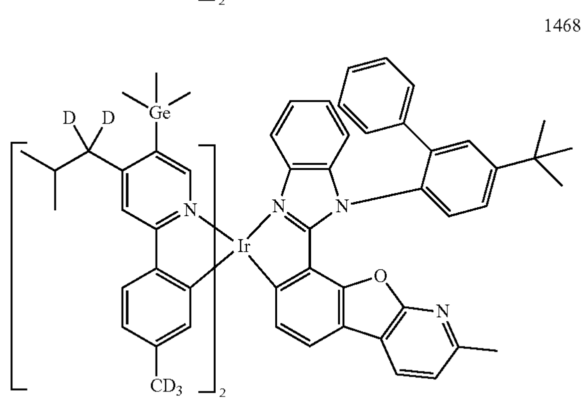
1469
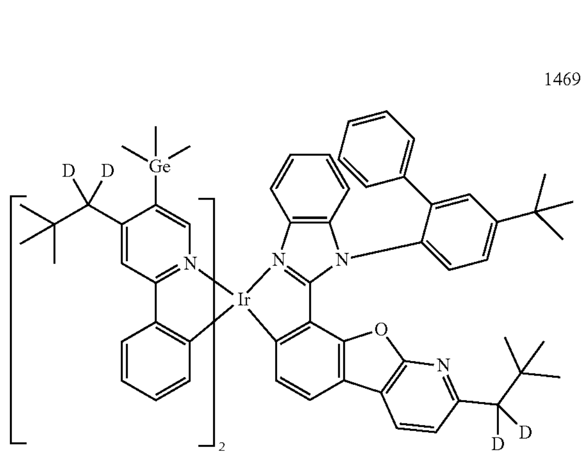

-continued
1470
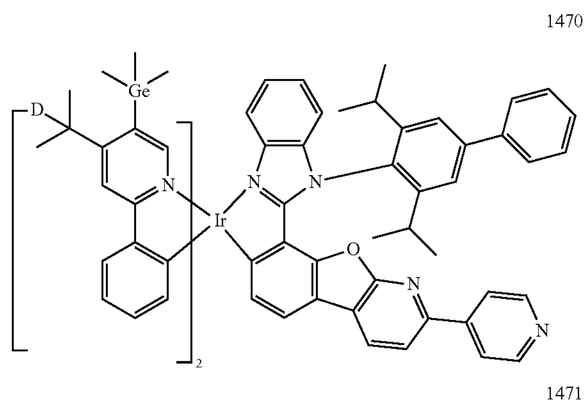
1471
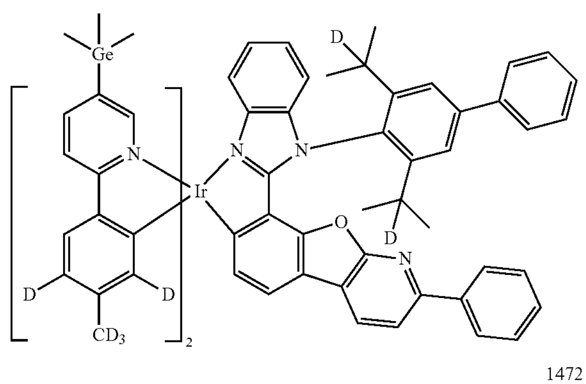
1472
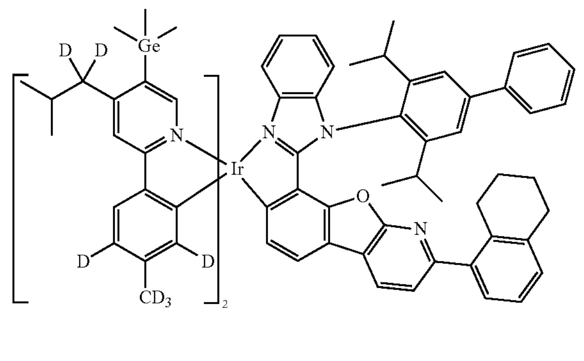
1473
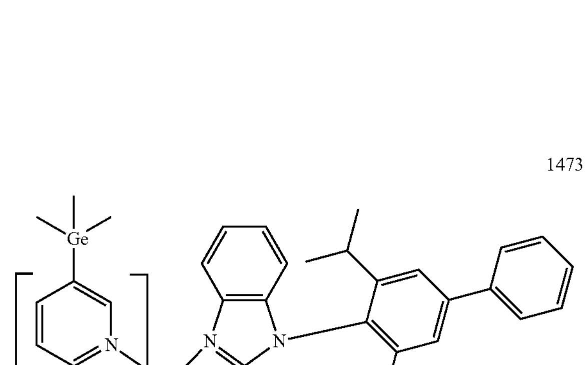
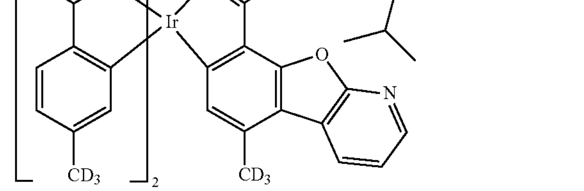
-continued
1474
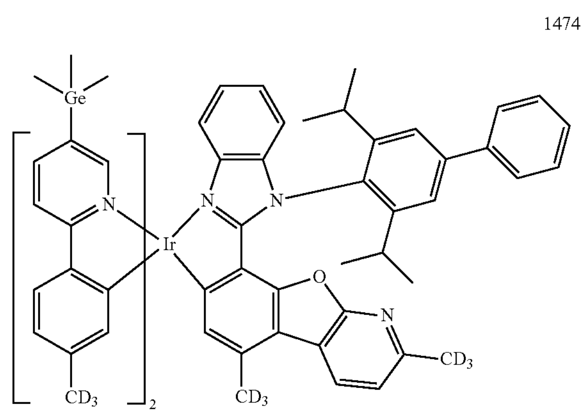
1475
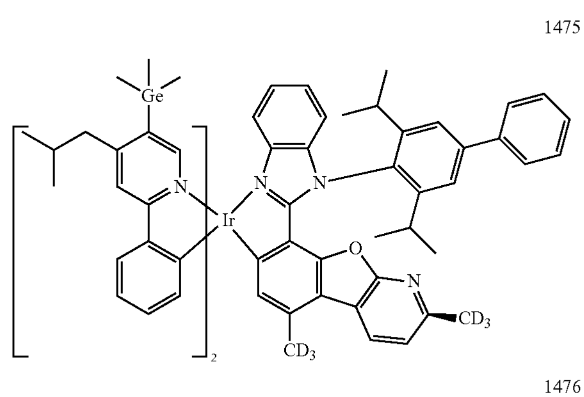
1476
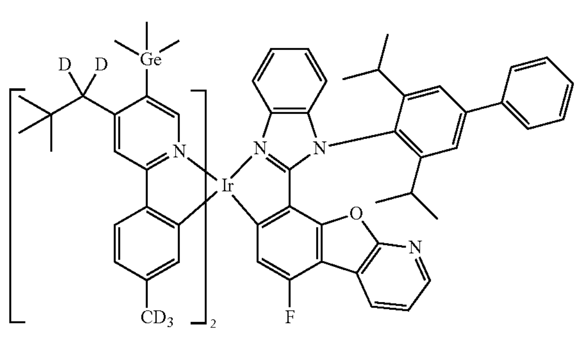
1477
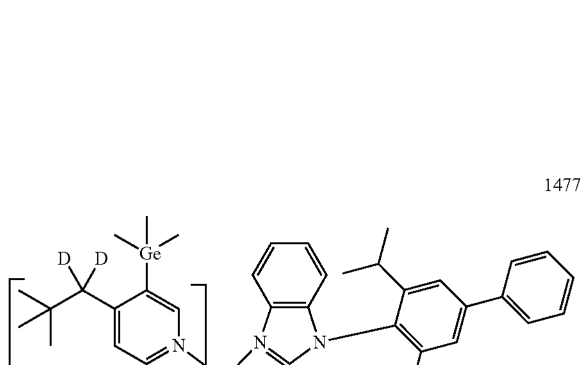
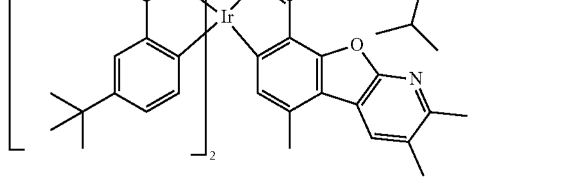

-continued
1478
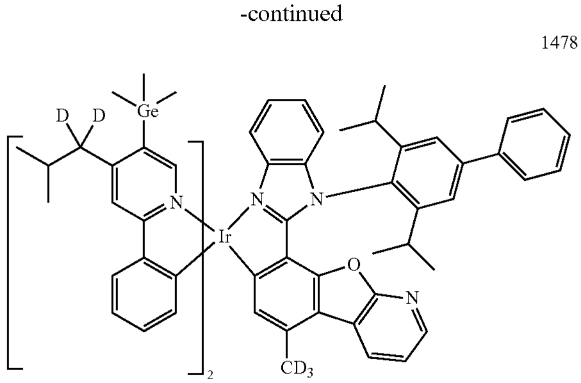
1479
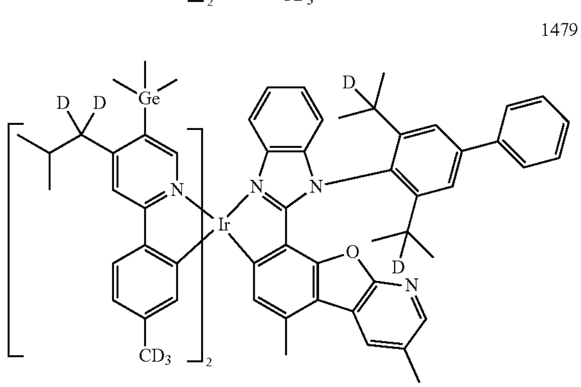
1480
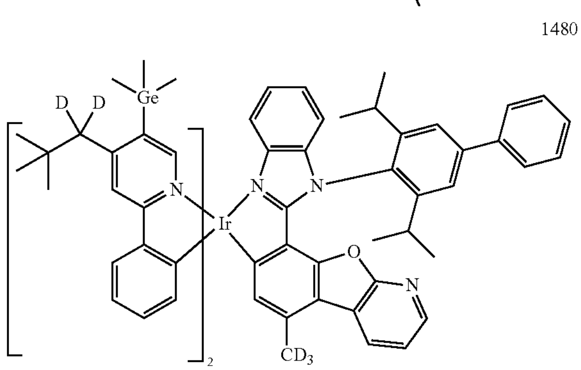
1481
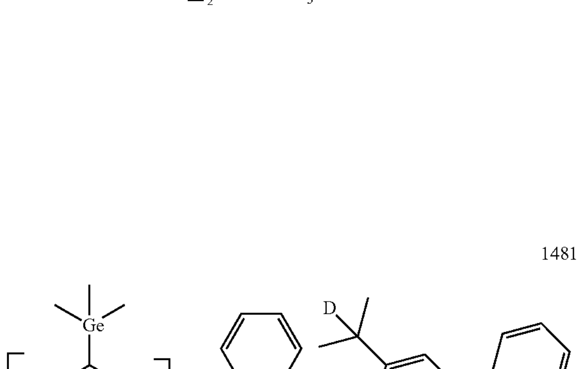
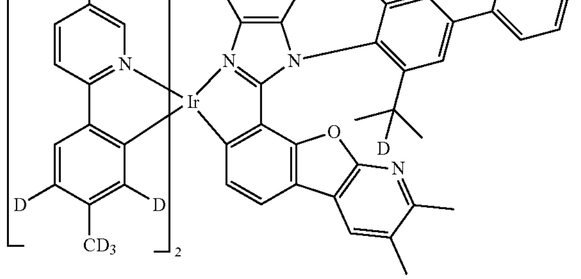
-continued
1482
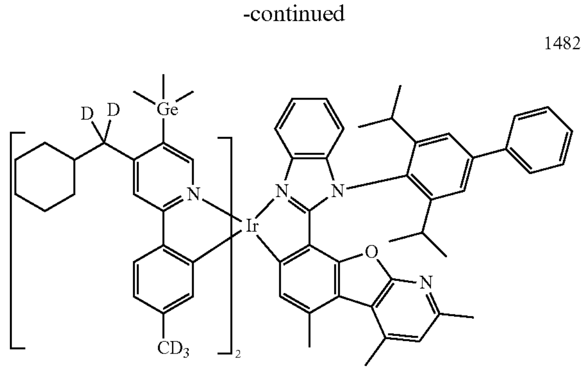
1483
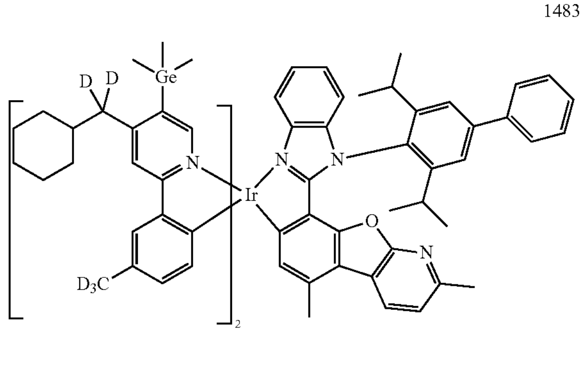
1484
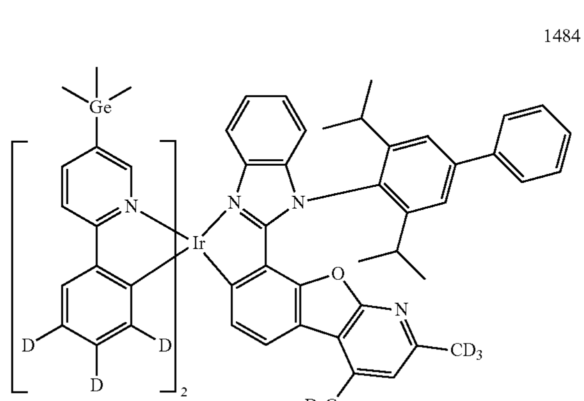
1485
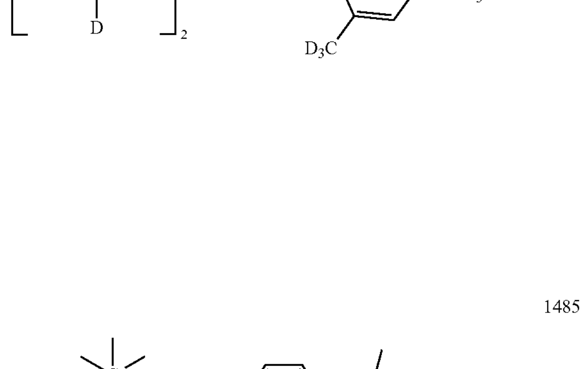
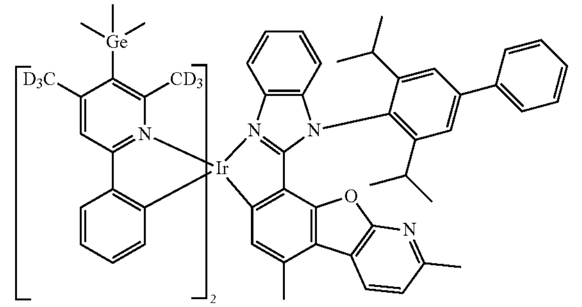

-continued
1486
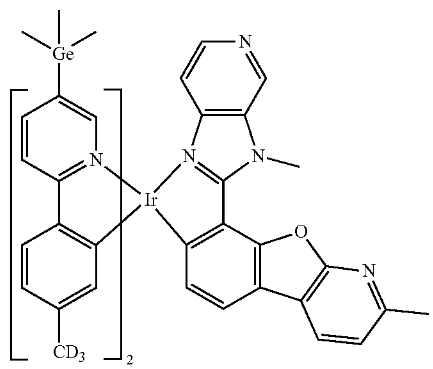
1487
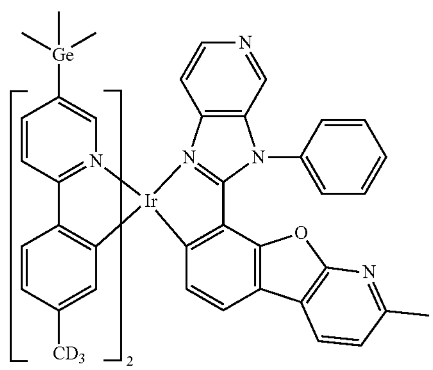
1488
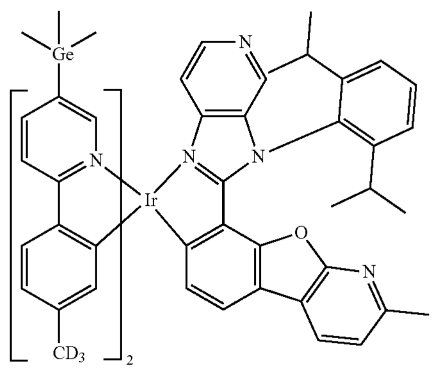
1489
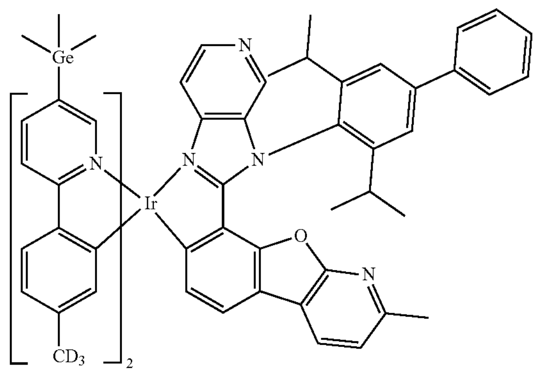
-continued
1490
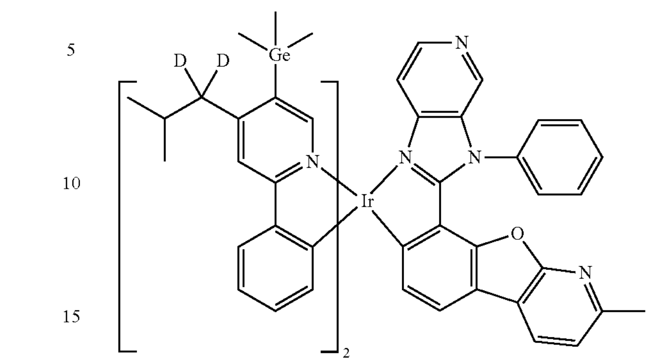
1491
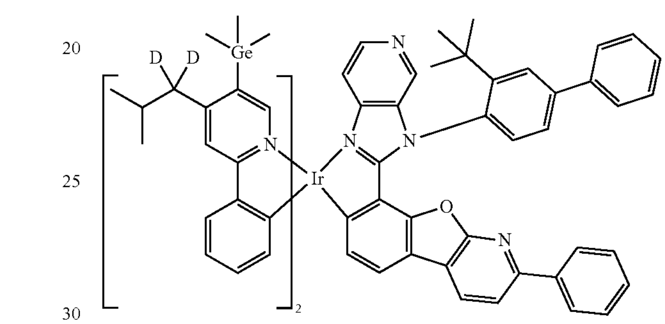
1492
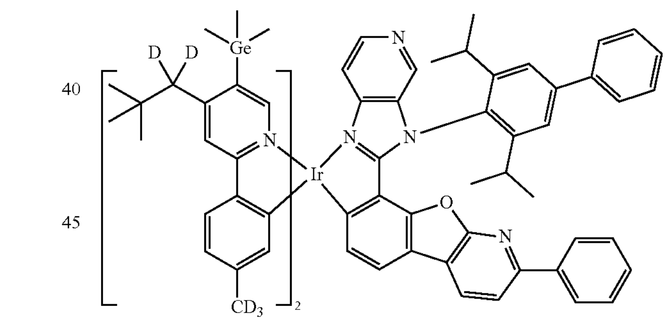
1493
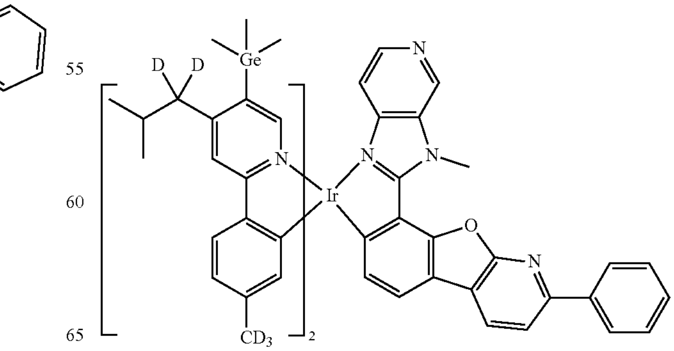

-continued
1494
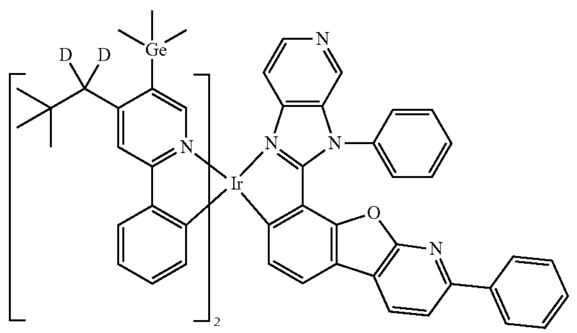
1495
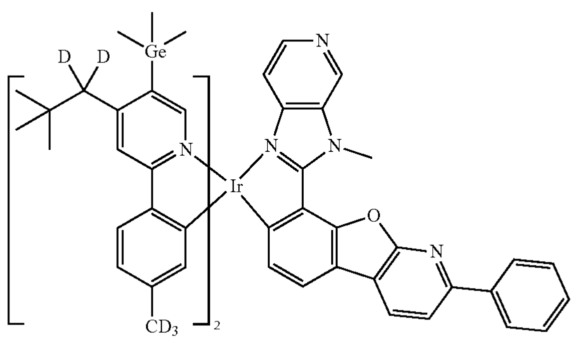
1496
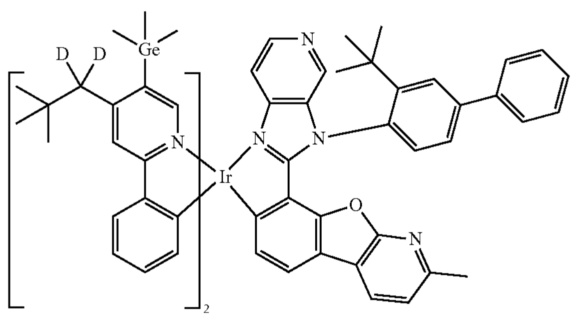
1497
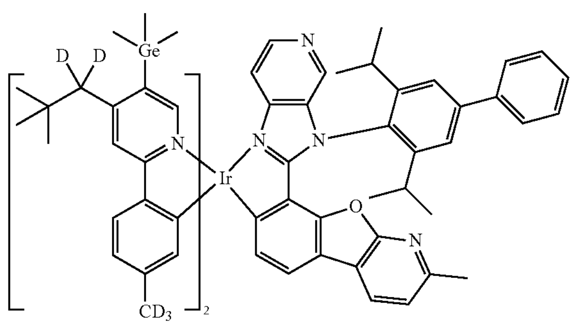
-continued
1498
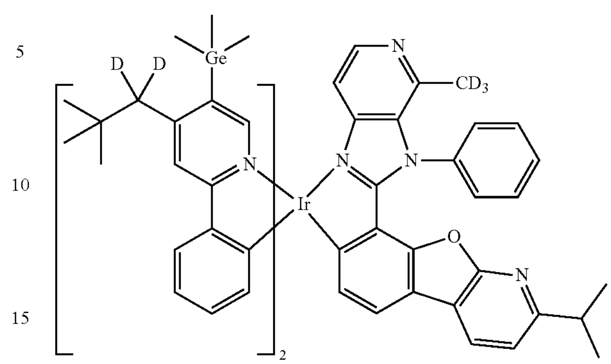
1499
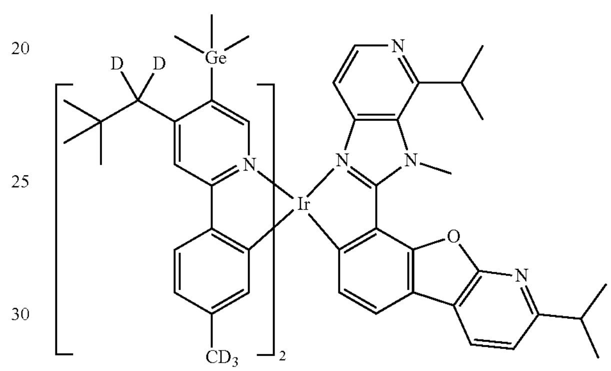
1500
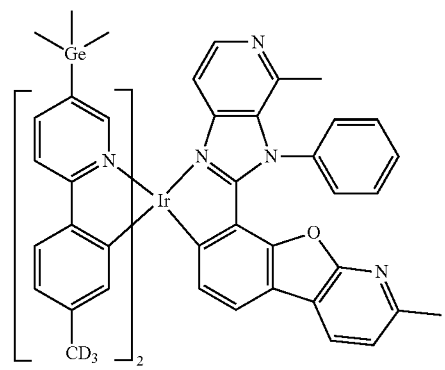
1501
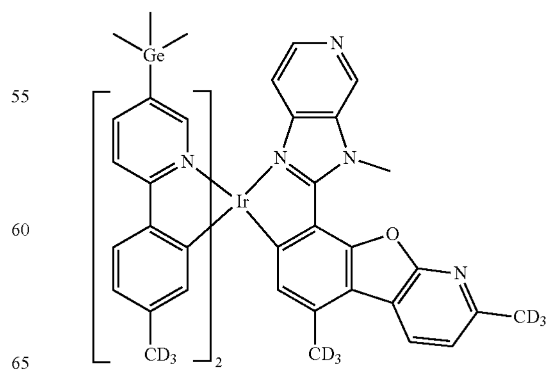

-continued
1502
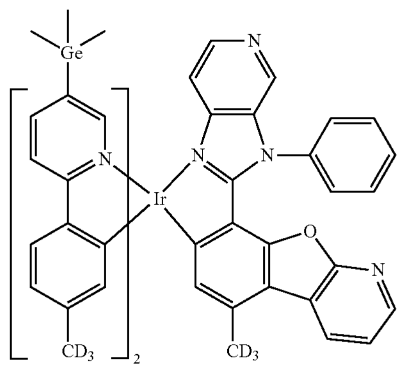
1503
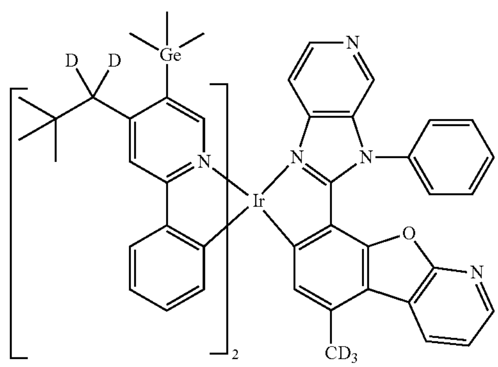
1504
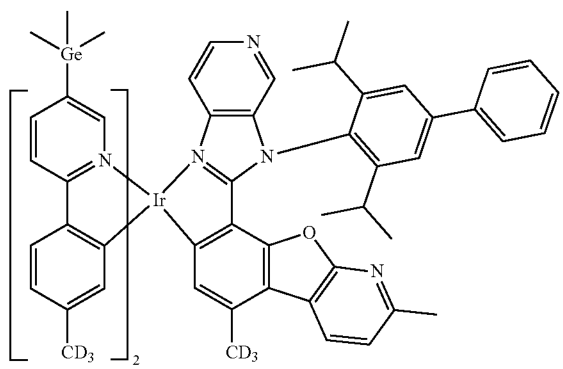
1505
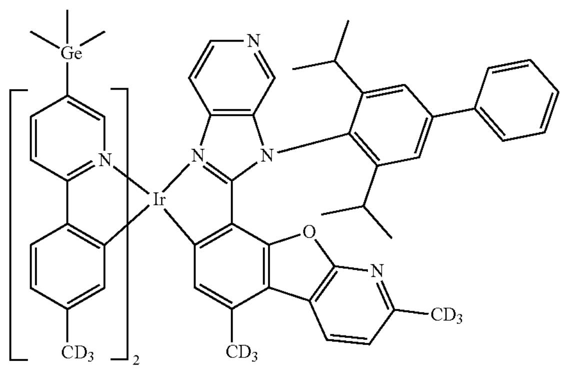
-continued
1506
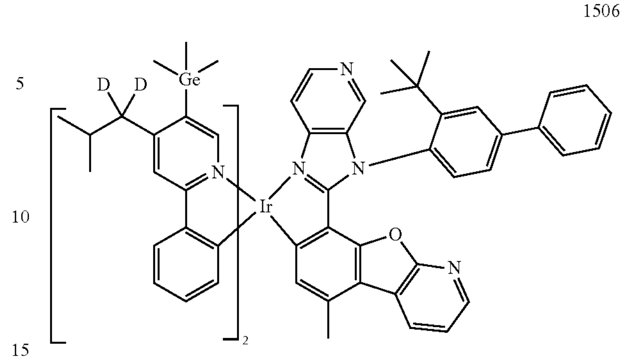
1507
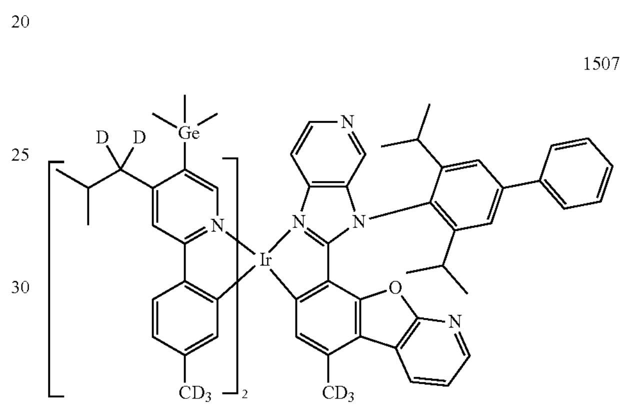
1508
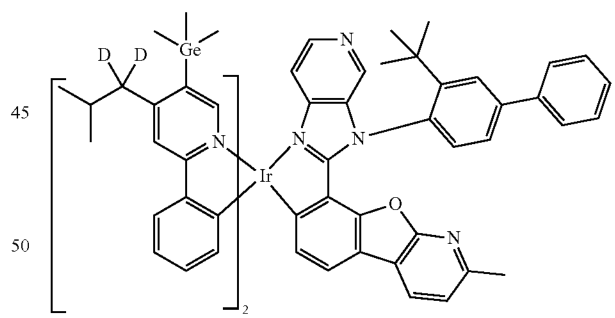
1509
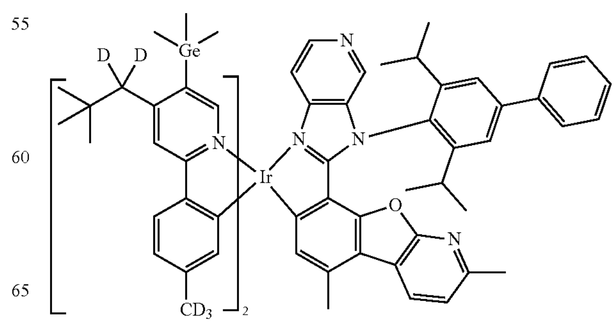

-continued
1510
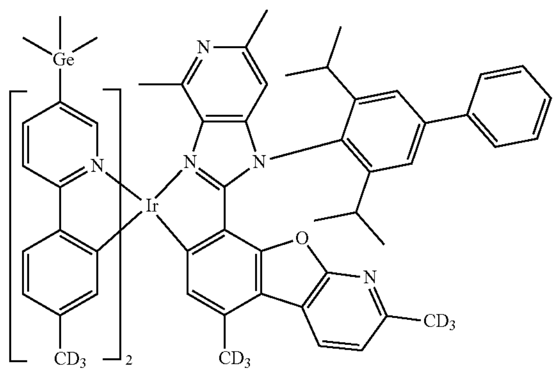
1511
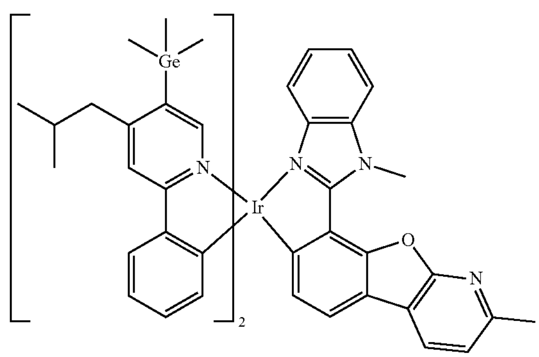
1512
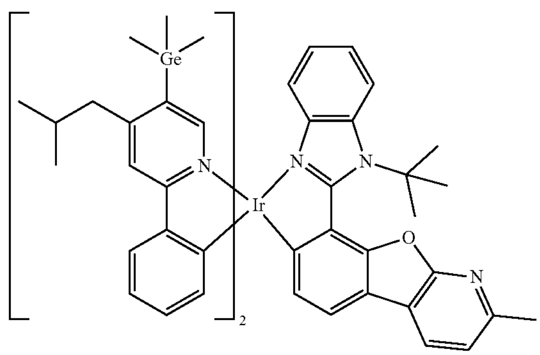
1513
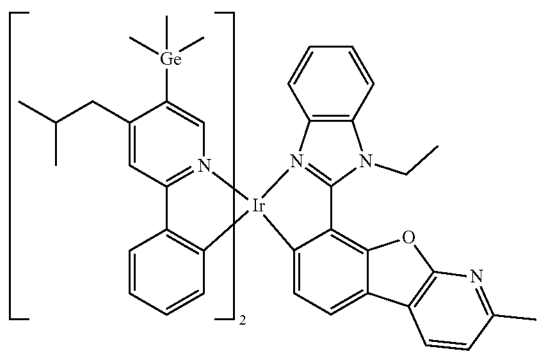
-continued
1514
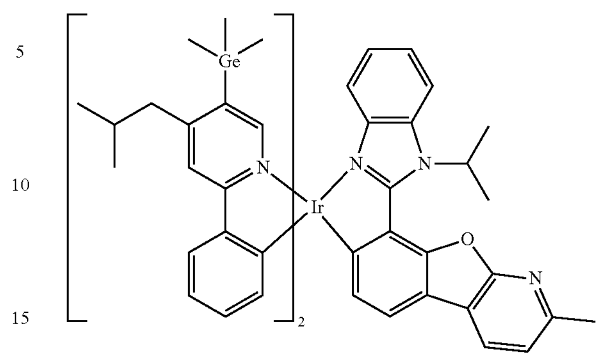
1515
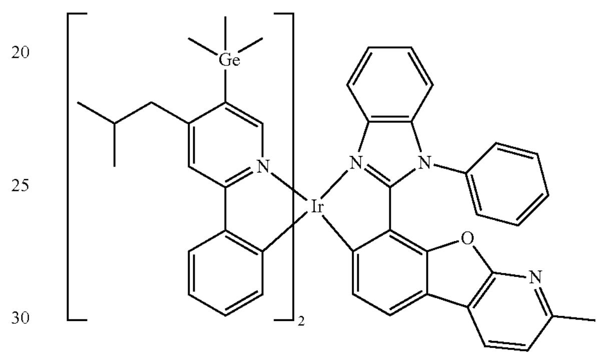
1516
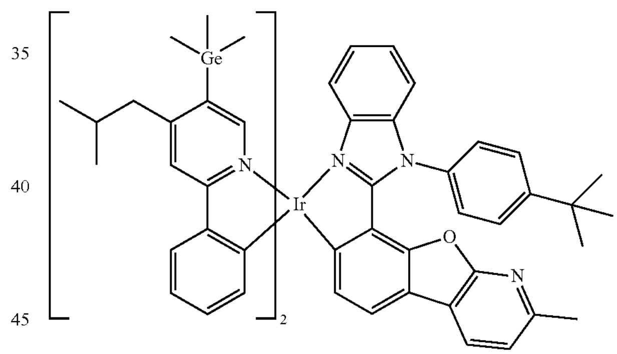
1517
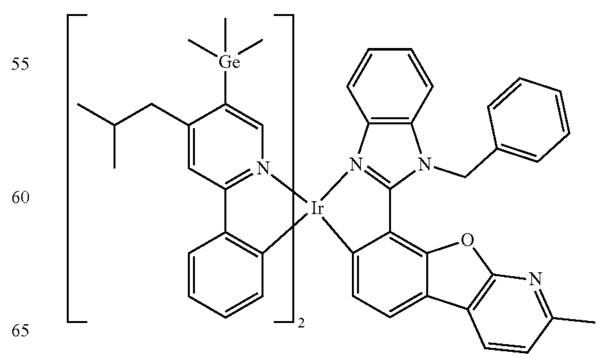

-continued
1518
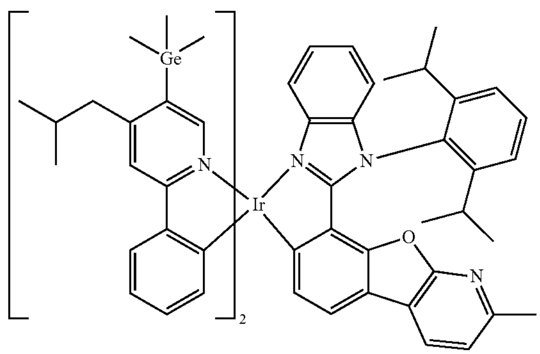
1519
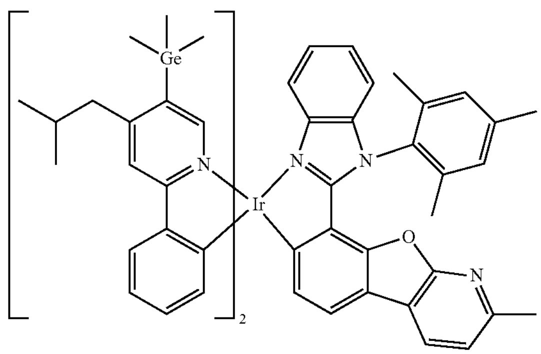
1520
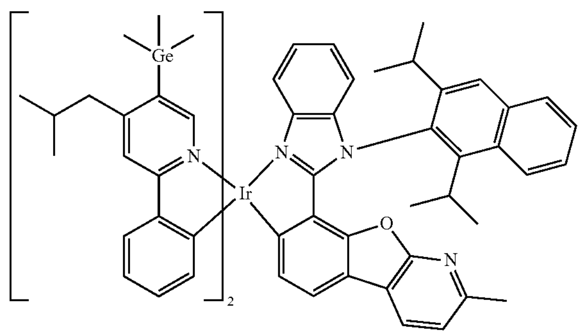
1521
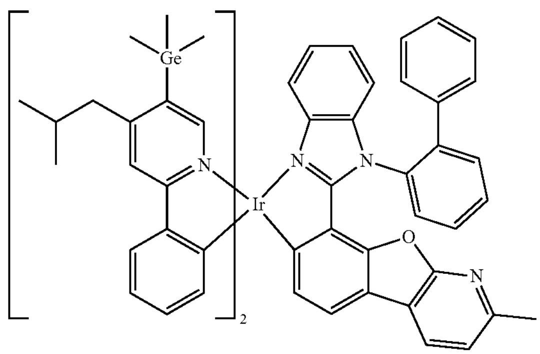
-continued
1522
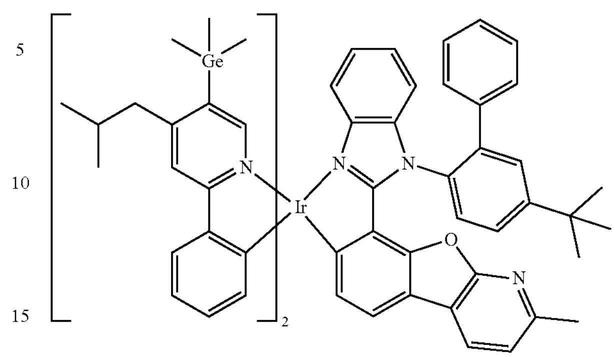
1523
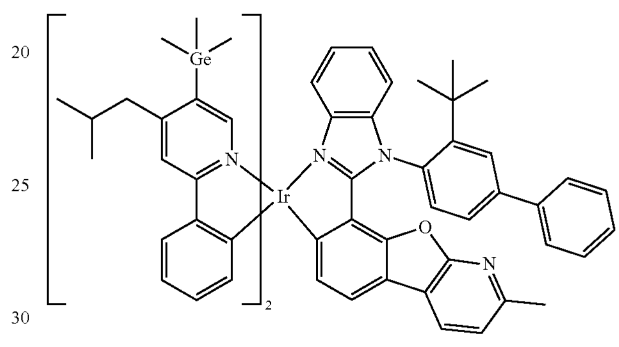
1524
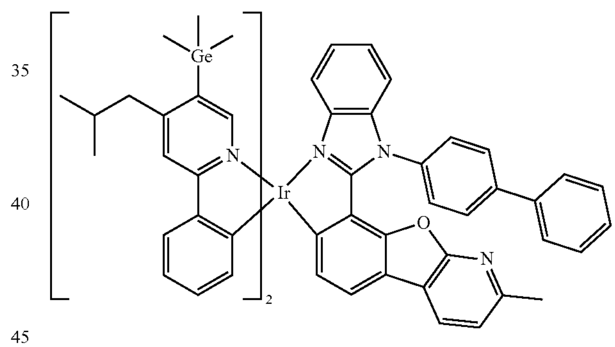
1525
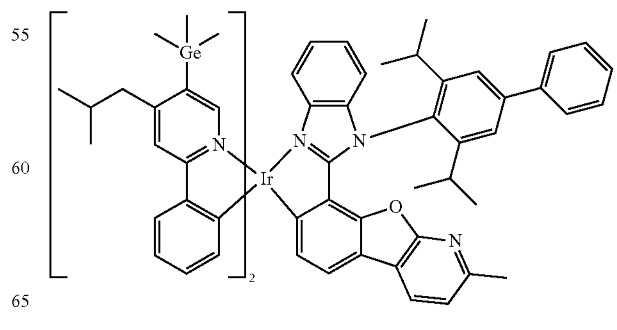

-continued
1526
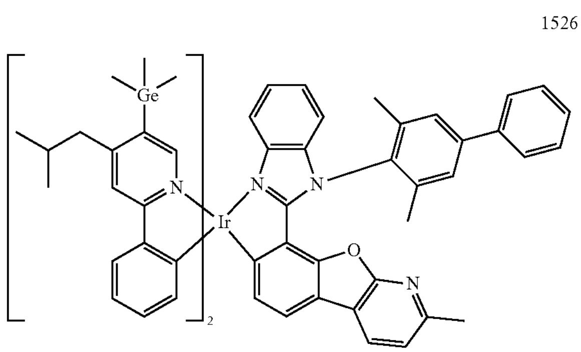
1527
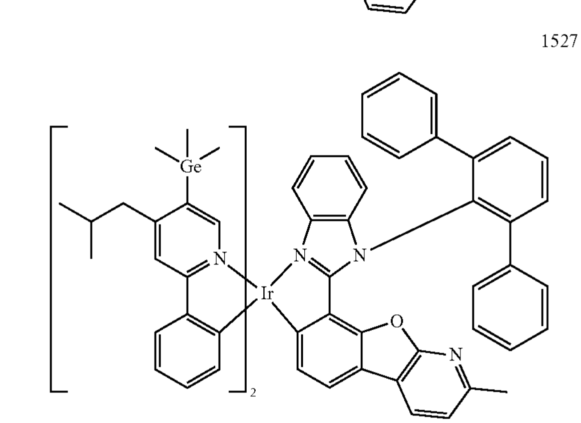
1528
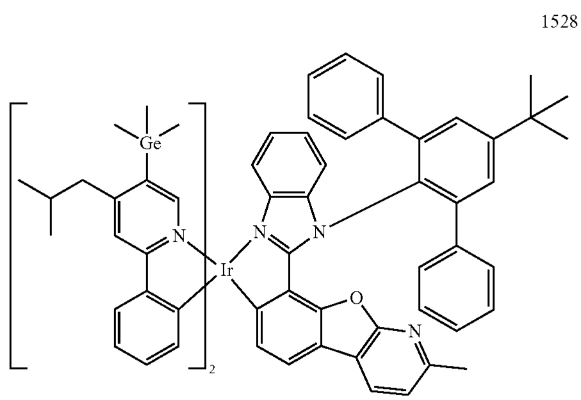
1529
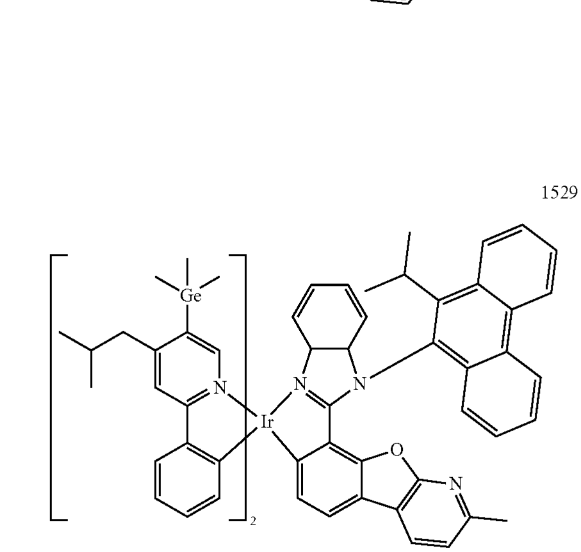
-continued
1530
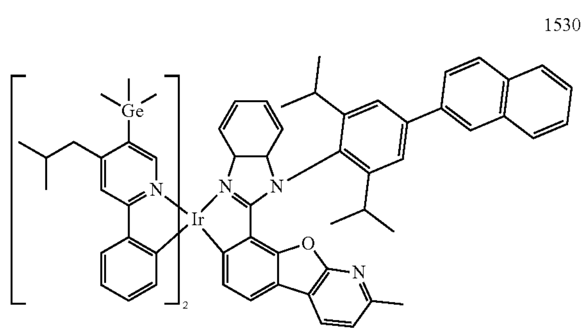
1531
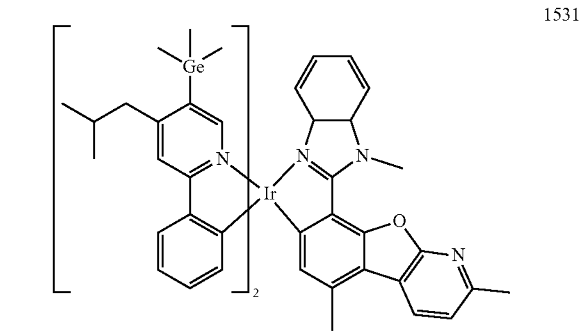
1532
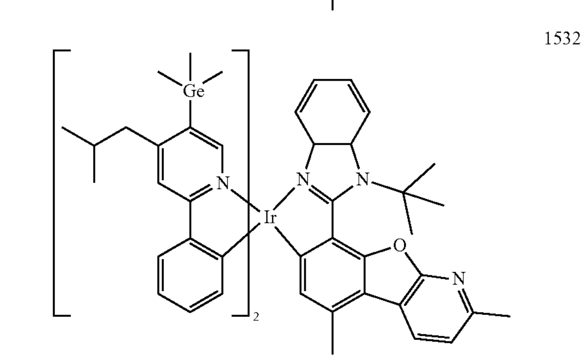
1533
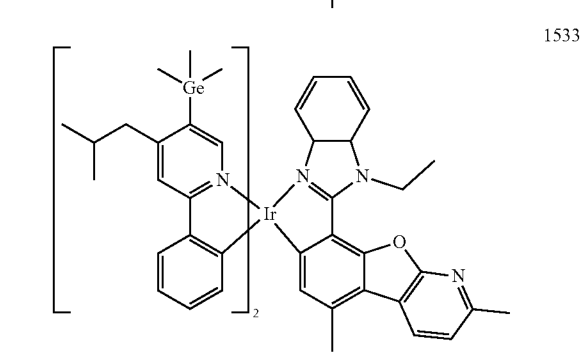
1534
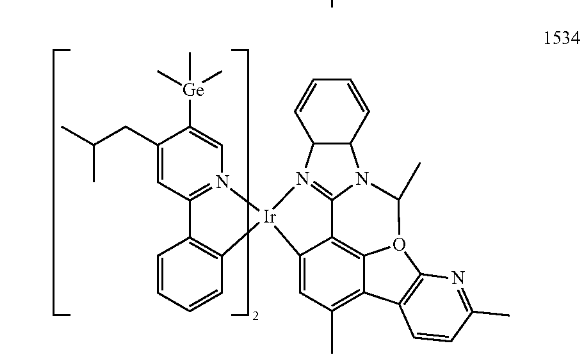

-continued
1535
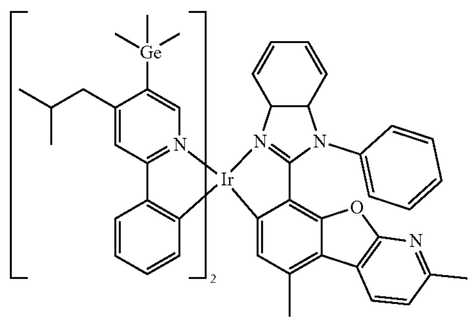
1536
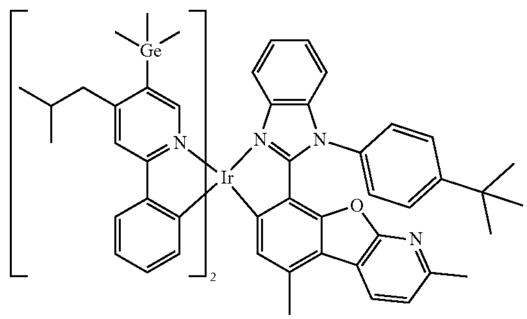
1537
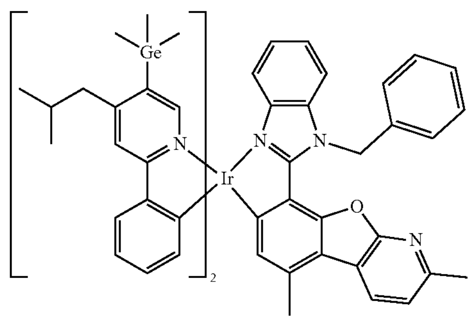
1538
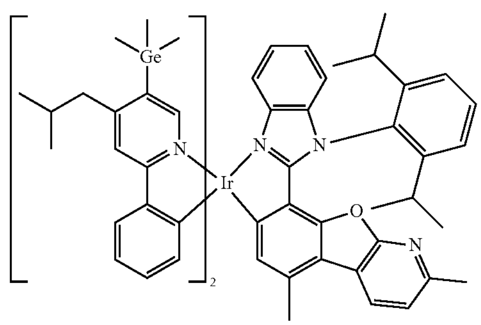
1539
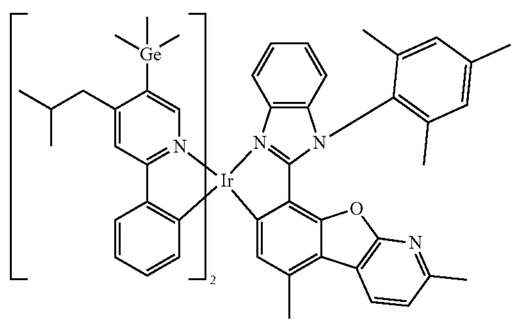
-continued
1540
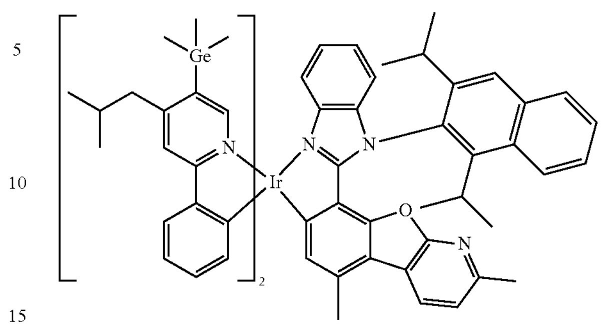
1541
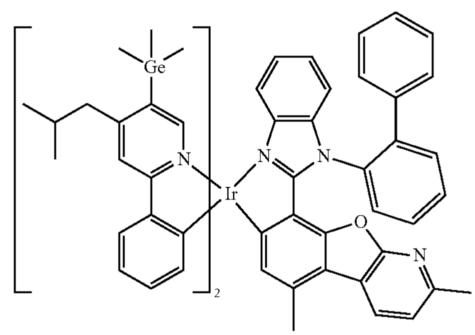
1542
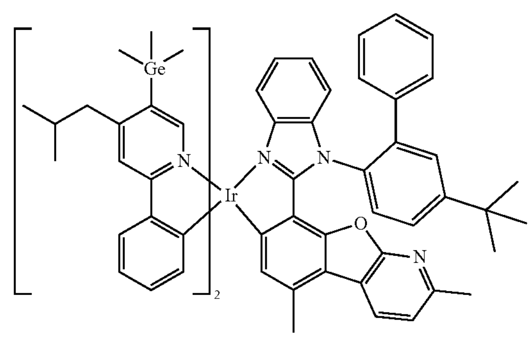
1543
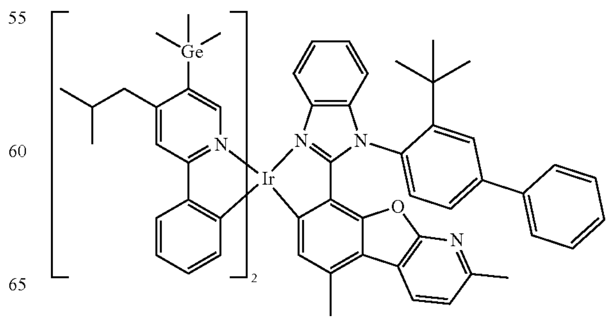

-continued
1544
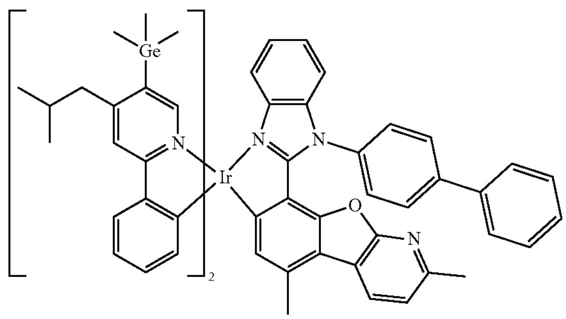
1545
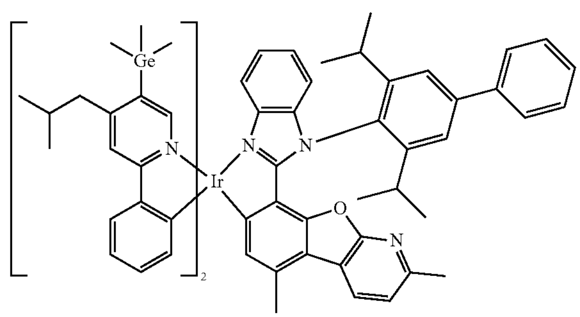
1546
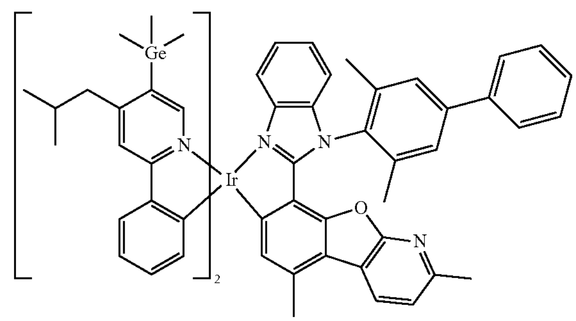
1547
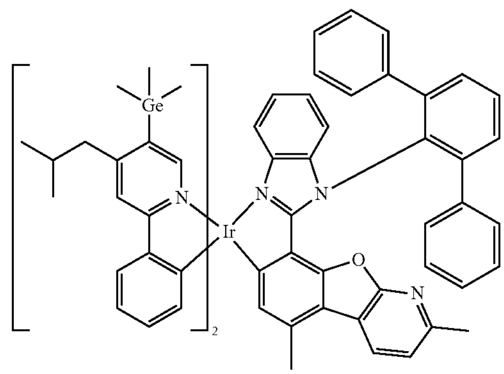
1548
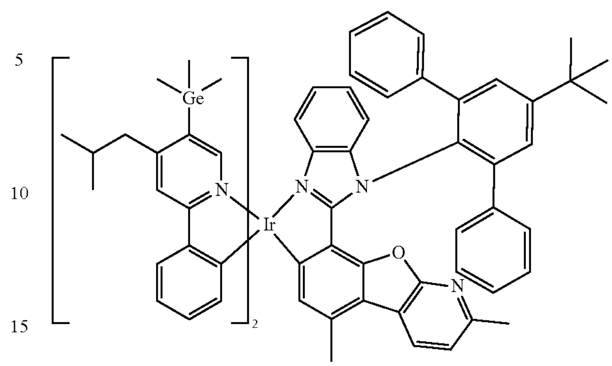
1549
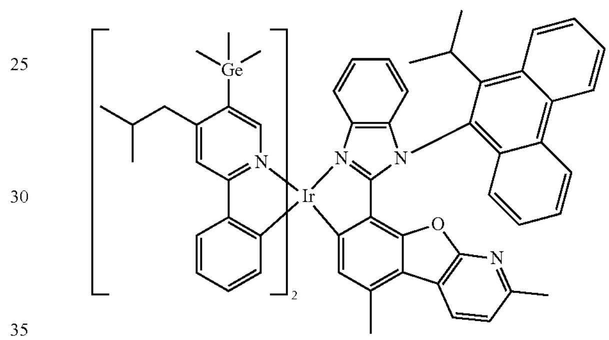
1550
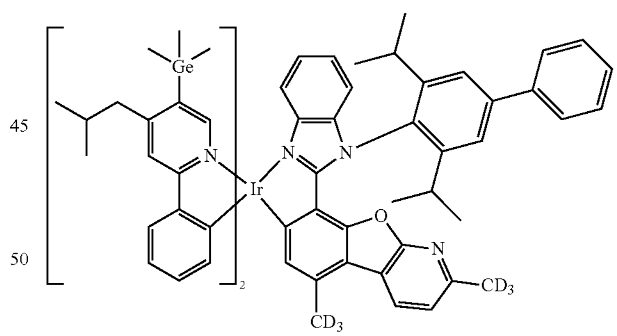
1551
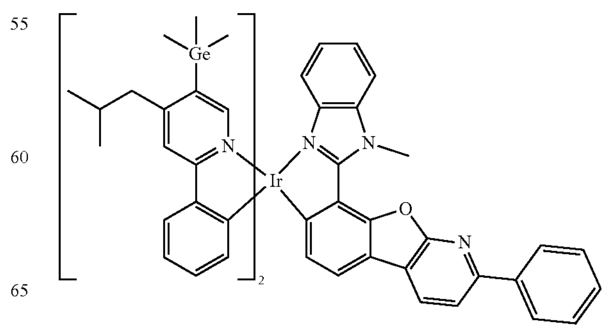

-continued
1552
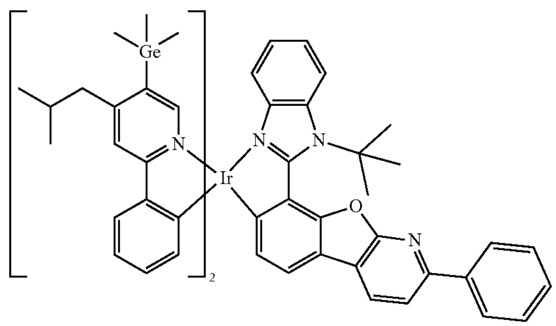
1553
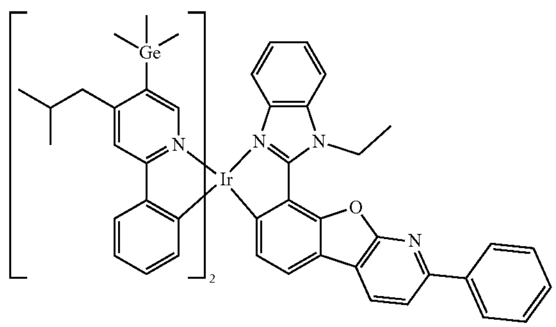
1554
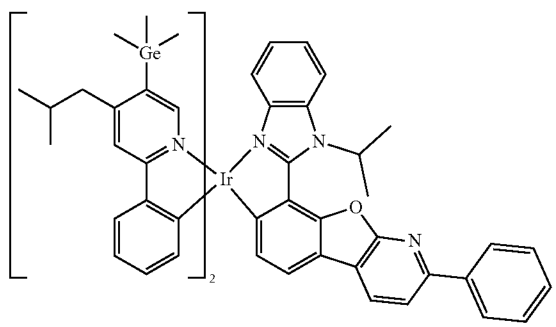
1555
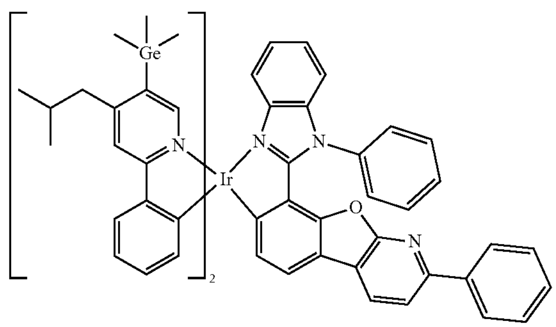
-continued
1556
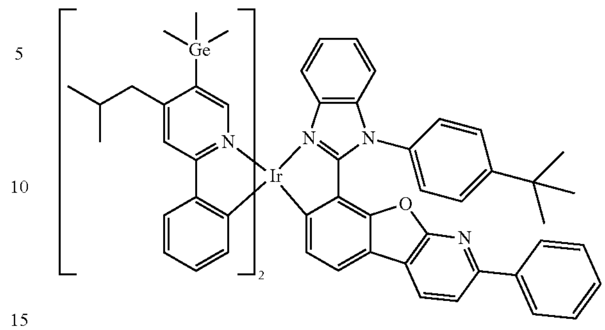
1557
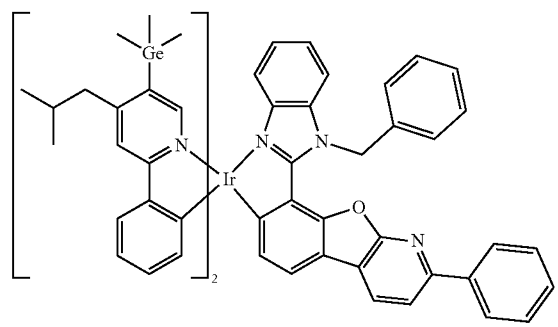
1558
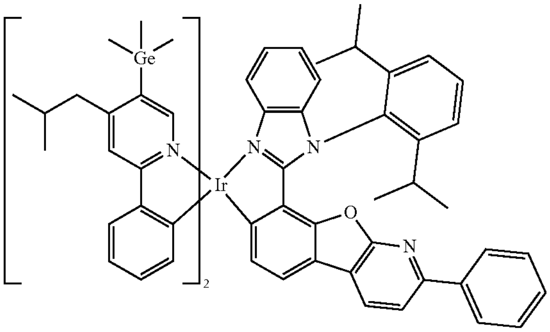
1559
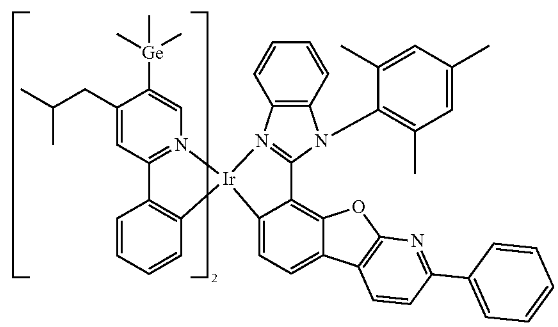

-continued
1560
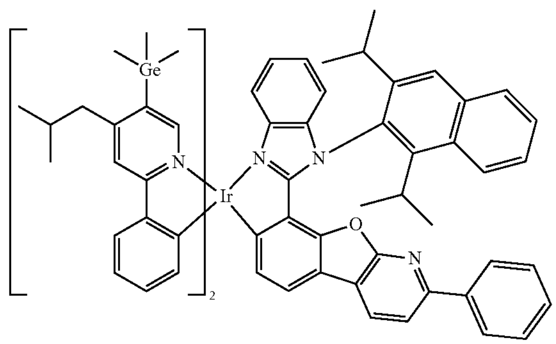
1561
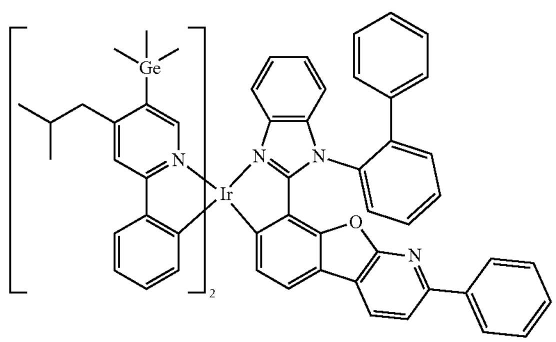
1562
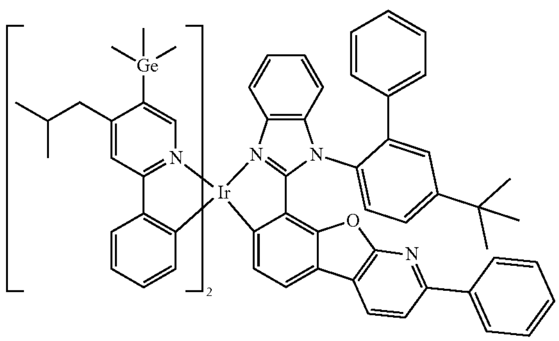
1563
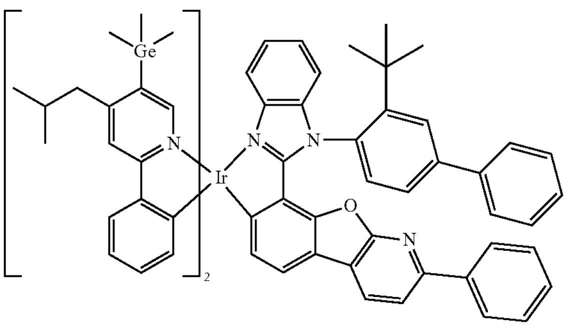
-continued
1564
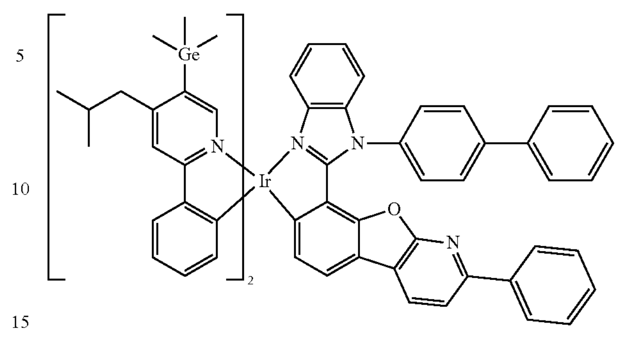
1565
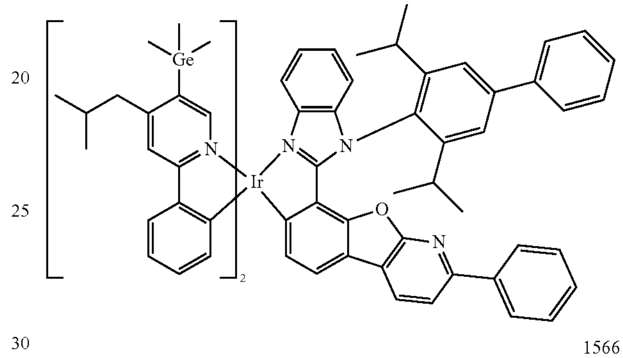
1566
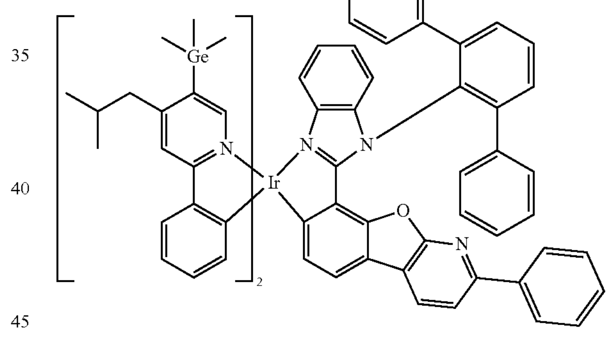
1567
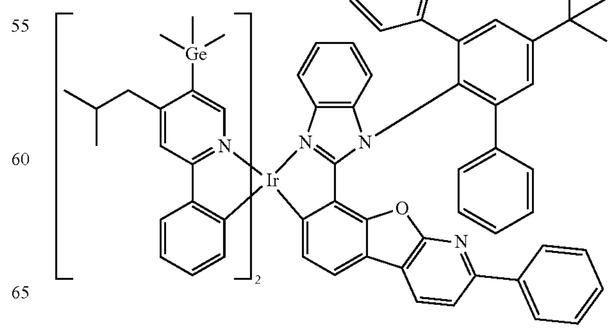

-continued
1568
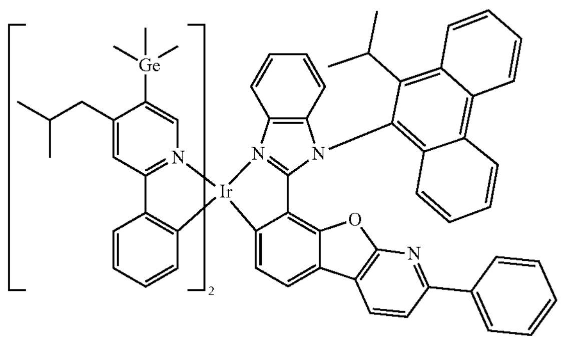
1569
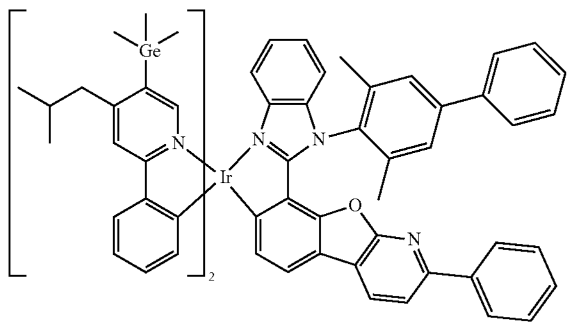
1570
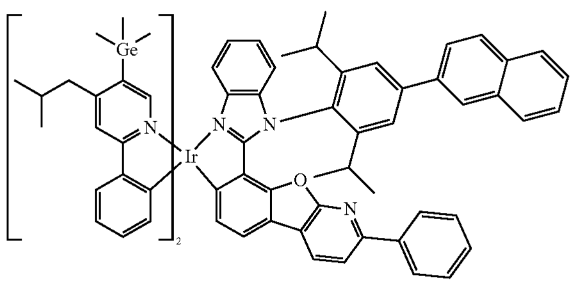
1571
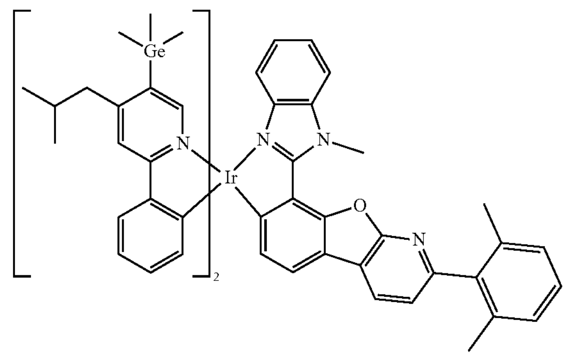
-continued
1572
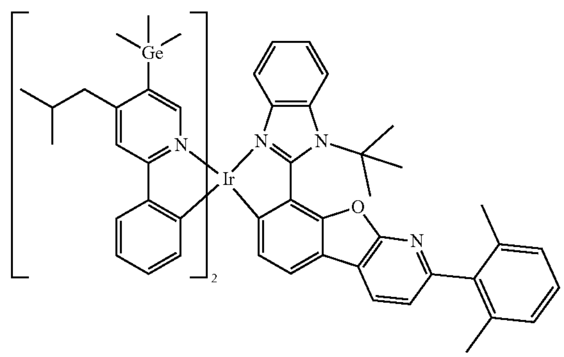
1573
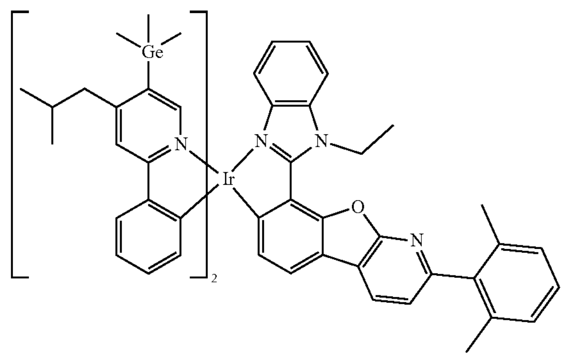
1574
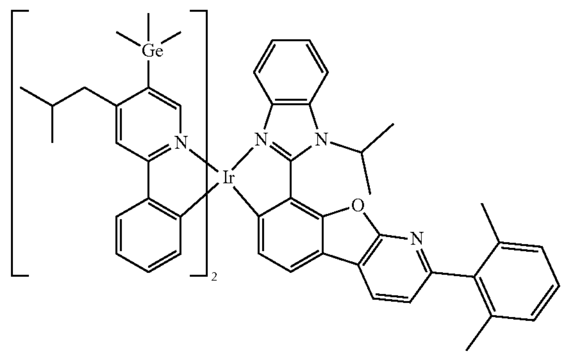
1575
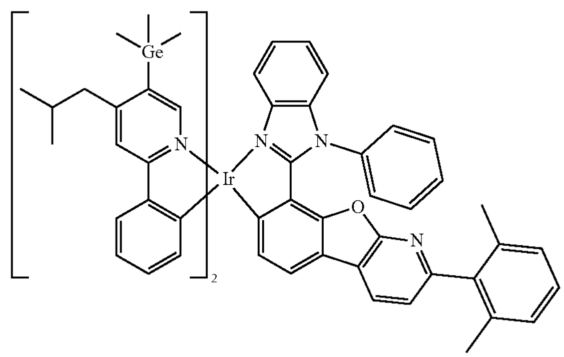

-continued
1576
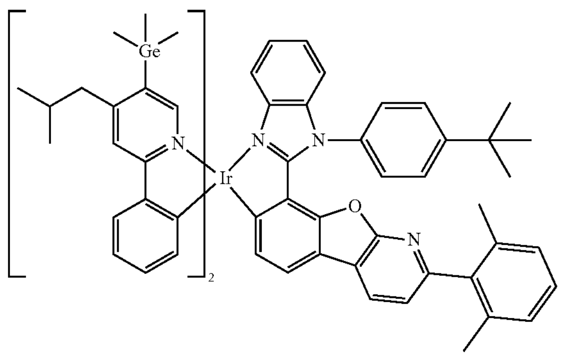
1577
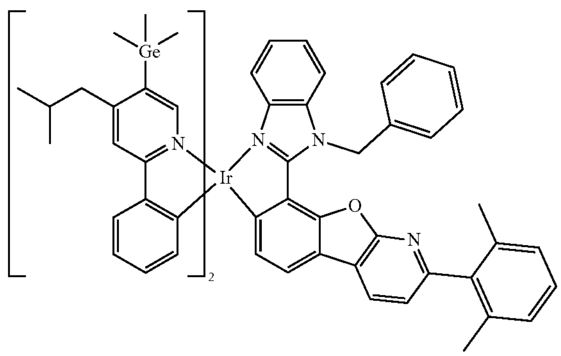
1578
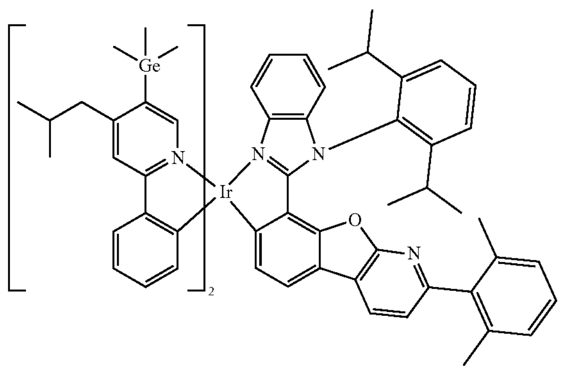
1579
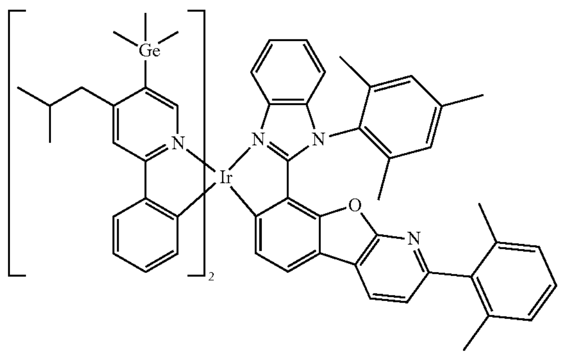
1580
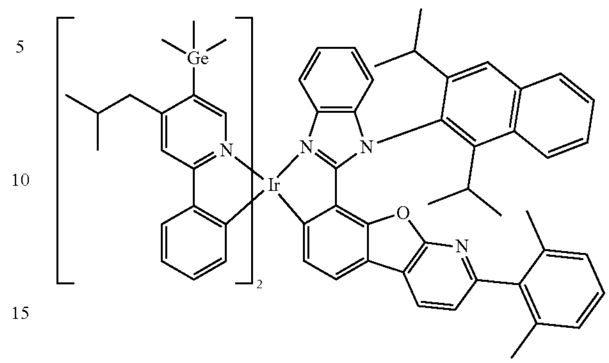
1581
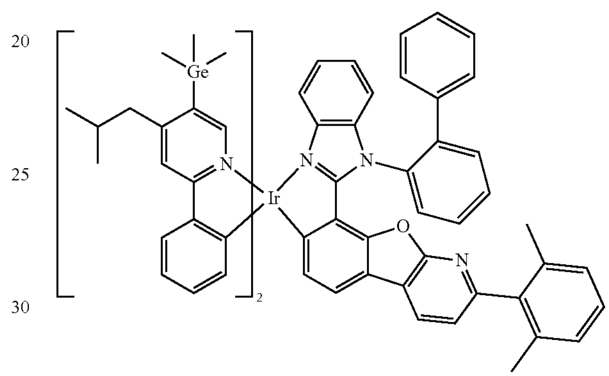
1582
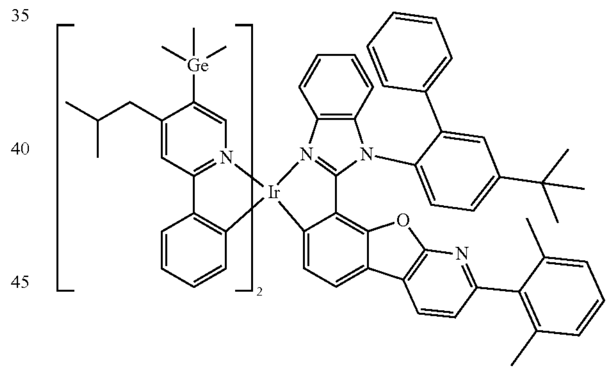
1583
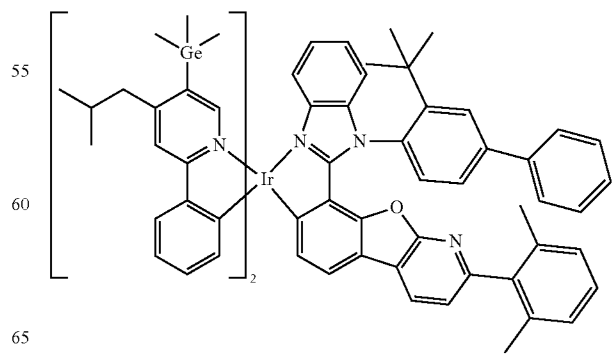

-continued
1584
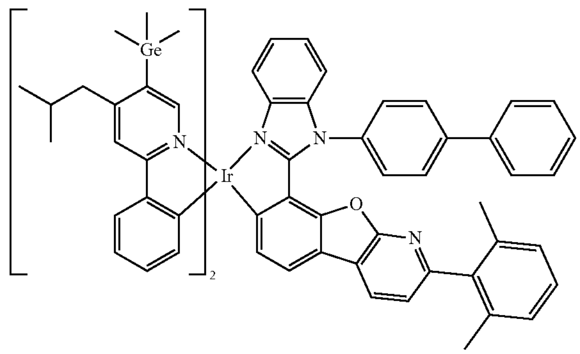
1585
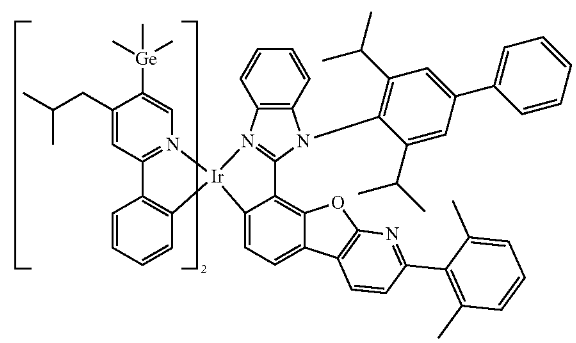
1586
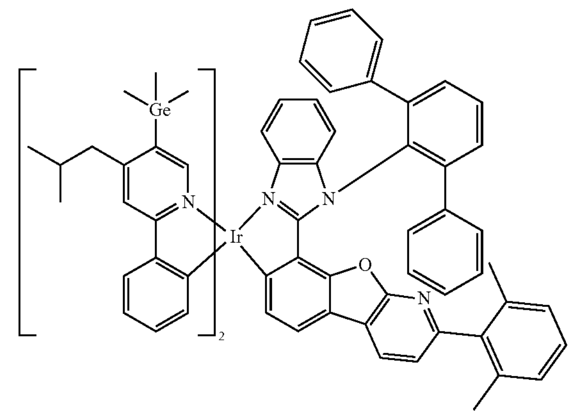
1587
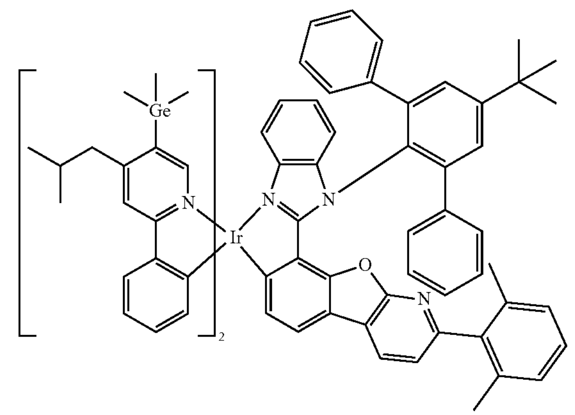
1588
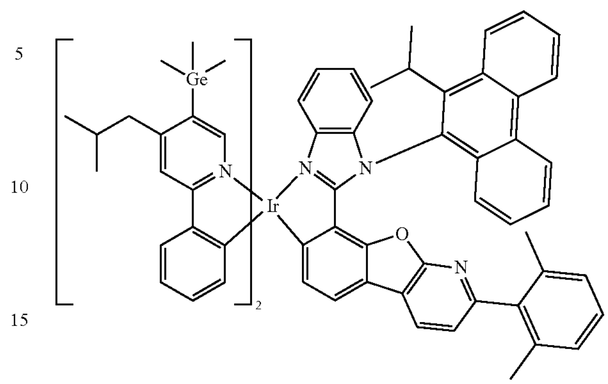
1589
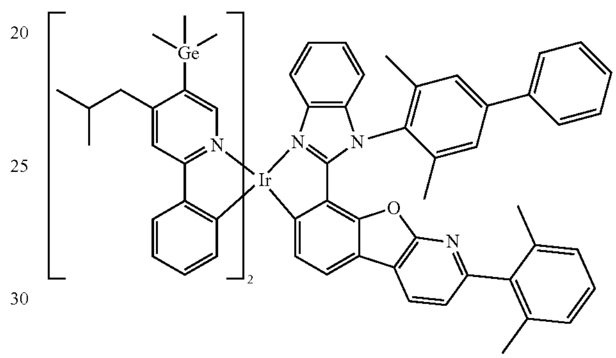
1590
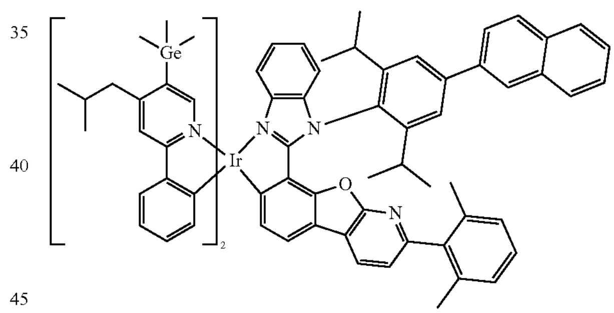
1591
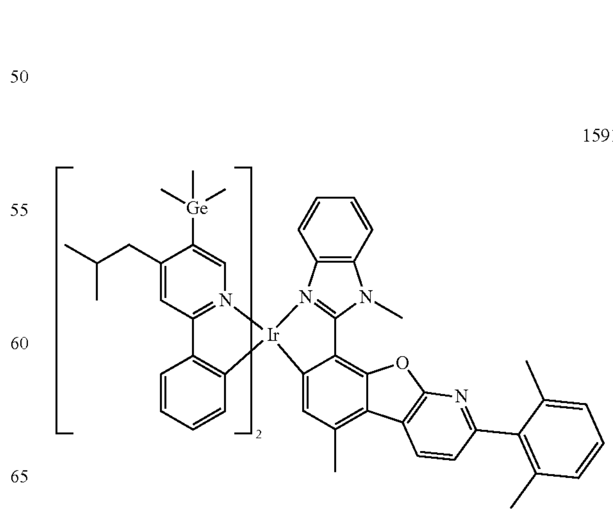

-continued
1592
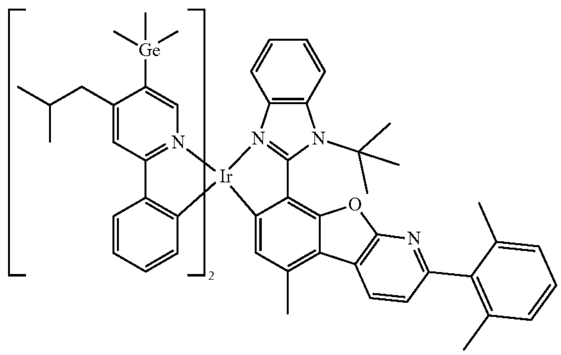
1593
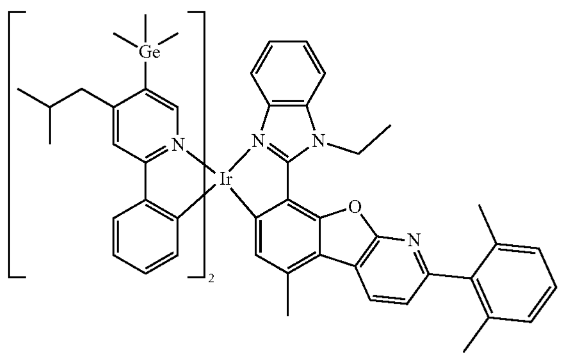
1594
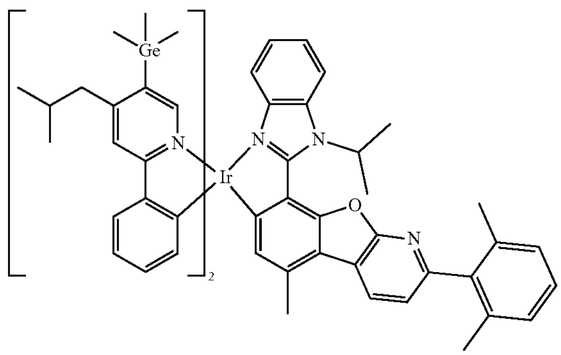
1595
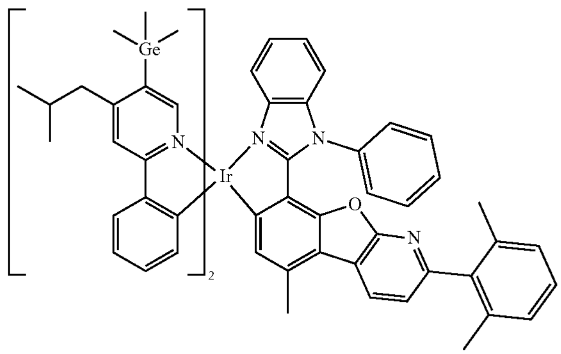
-continued
1596
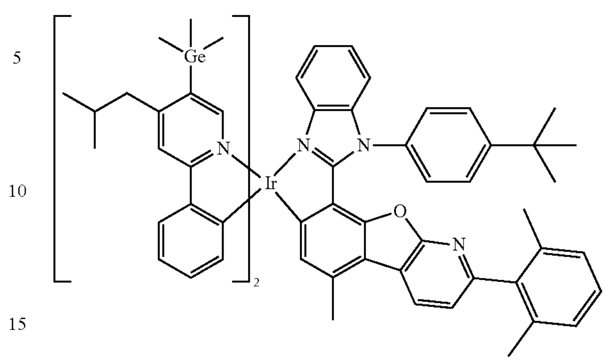
1597
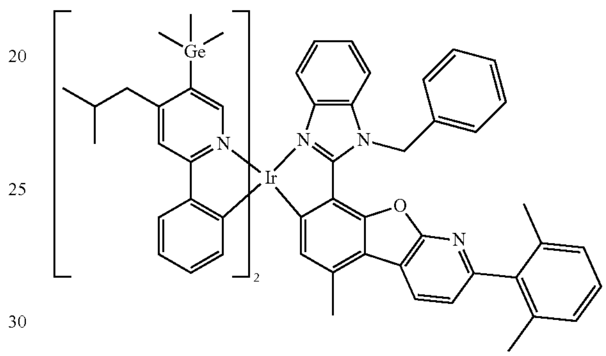
1598
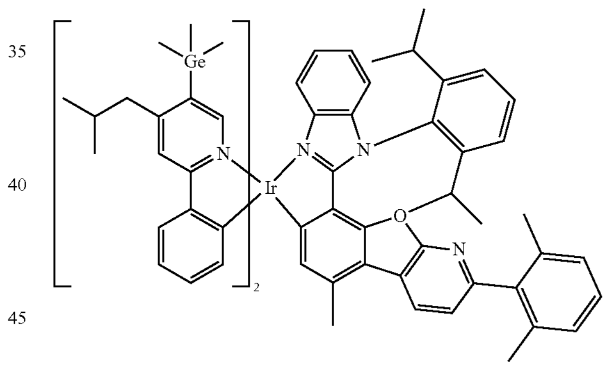
1599
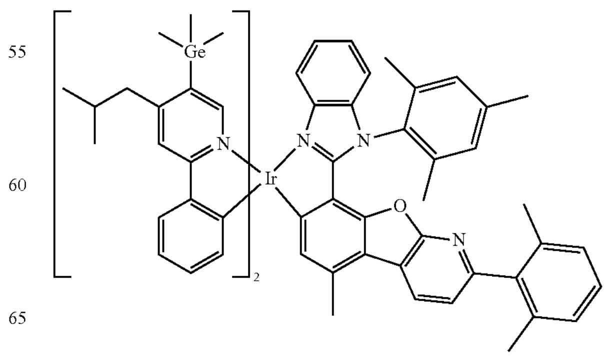

-continued
1600
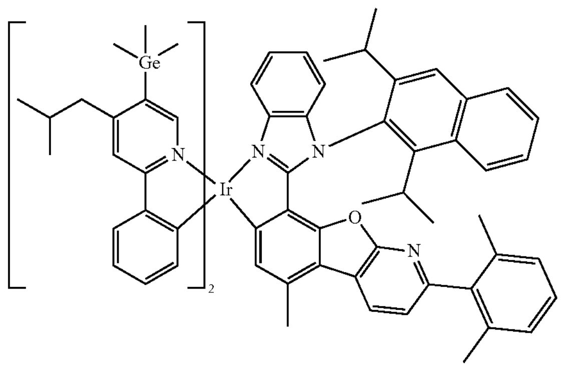
1601
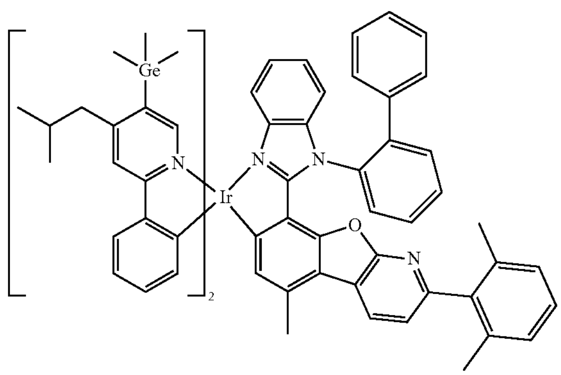
1602
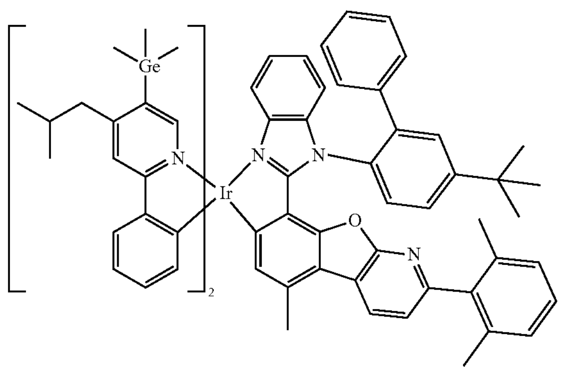
1603
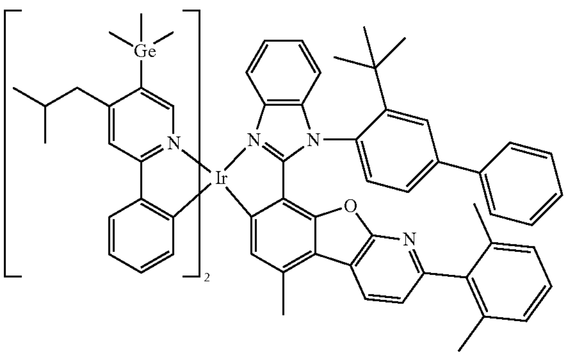
-continued
1604
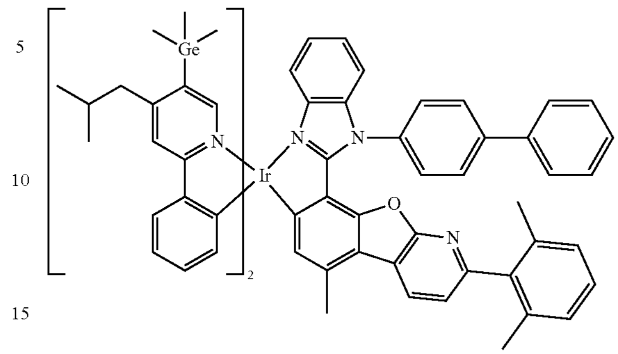
1605
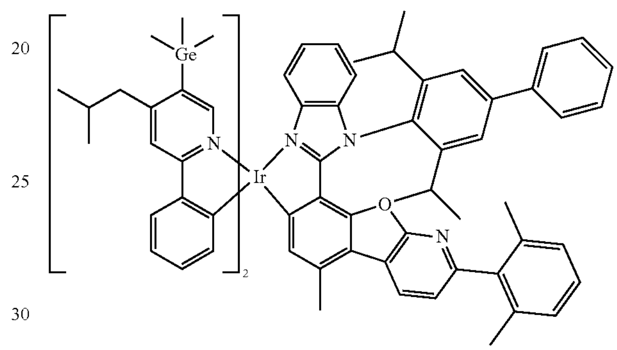
1606
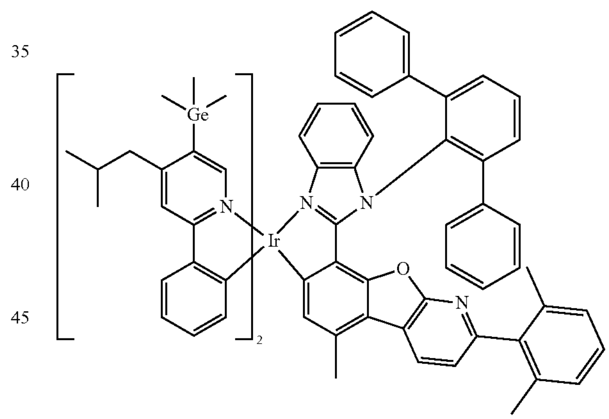
1607
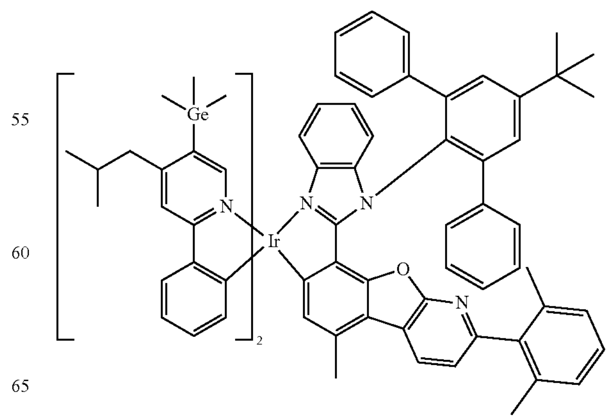

-continued
1608
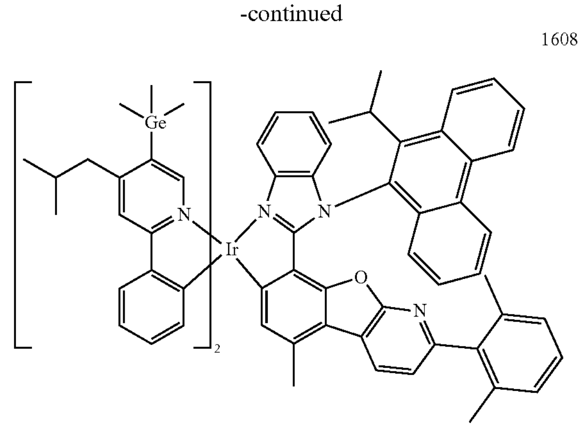
1609
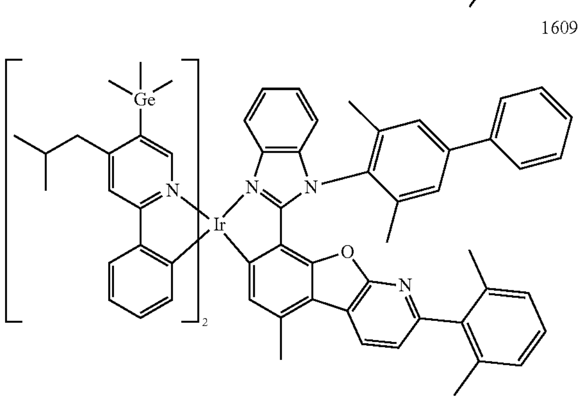
1610
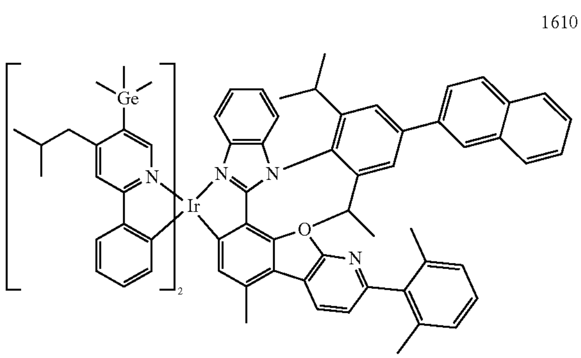
1611
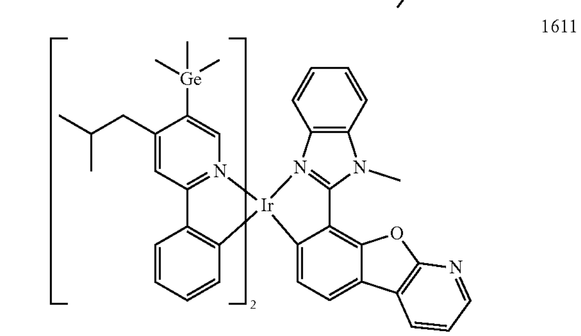
-continued
1612
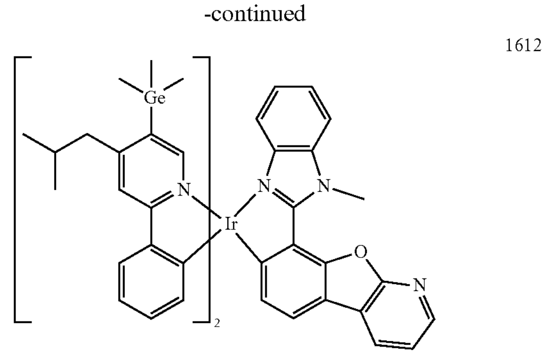
1613
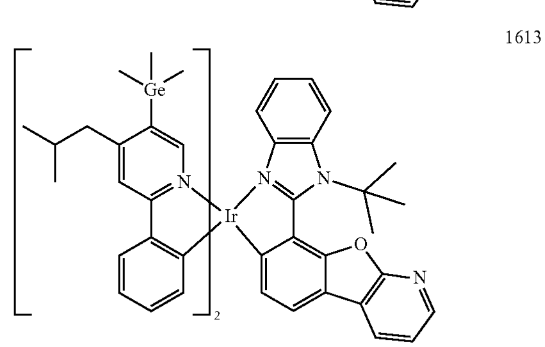
1614
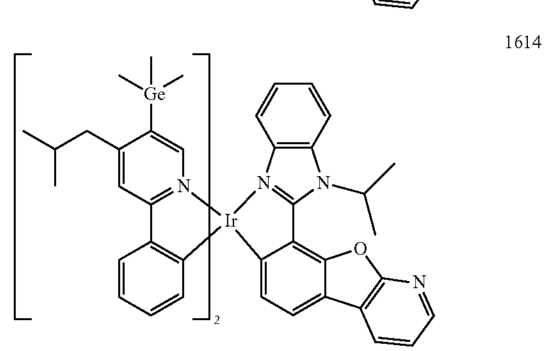
1615
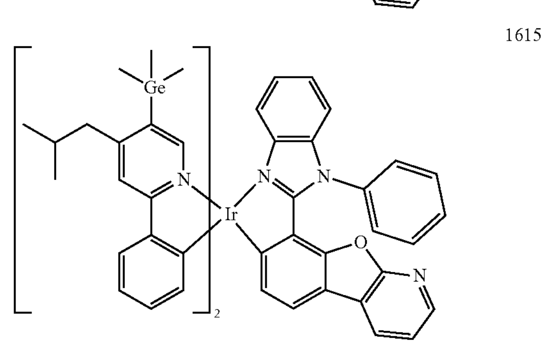
1616
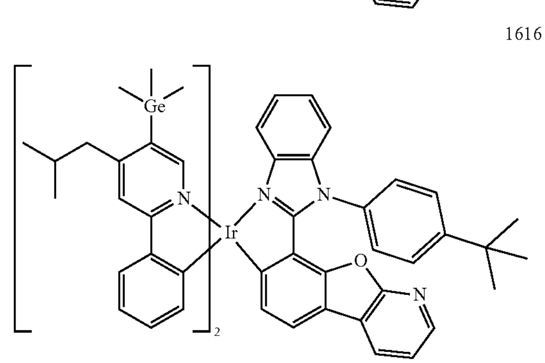

-continued
1617
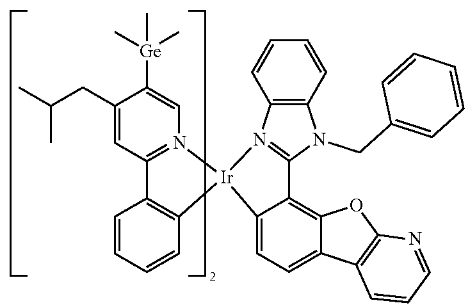
1618
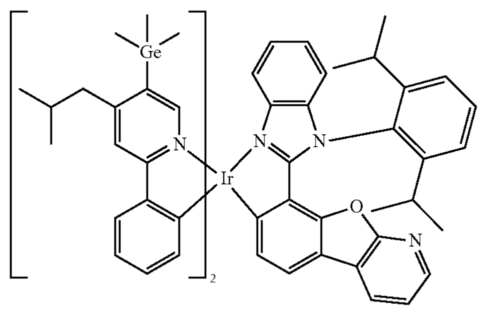
1619
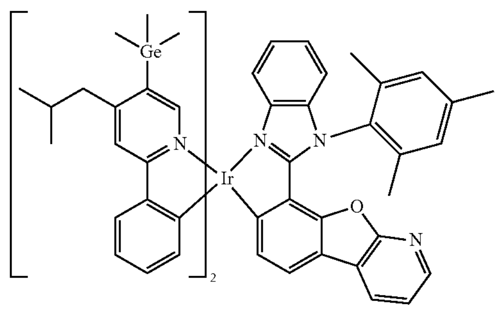
1620
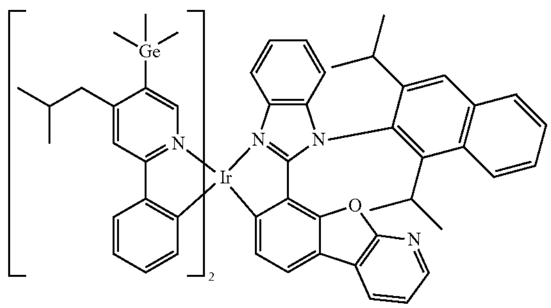
1621
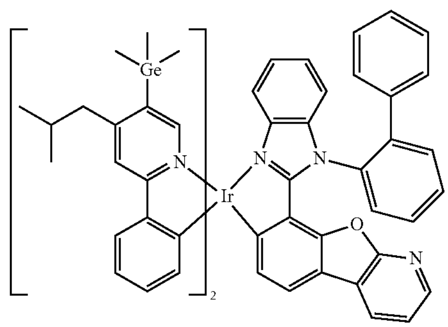
-continued
1622
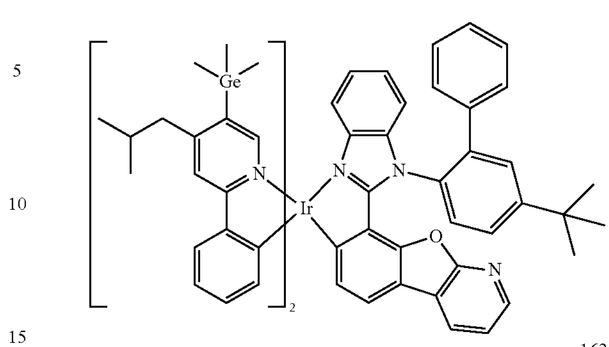
1623
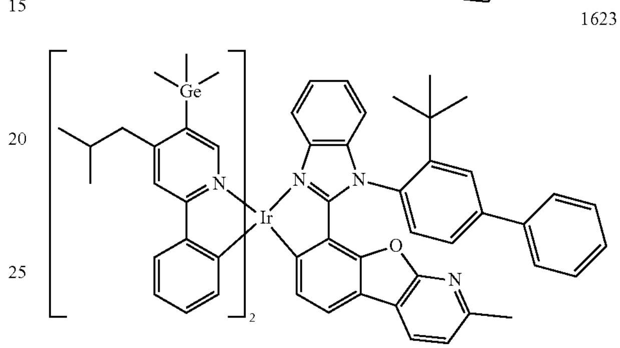
1624
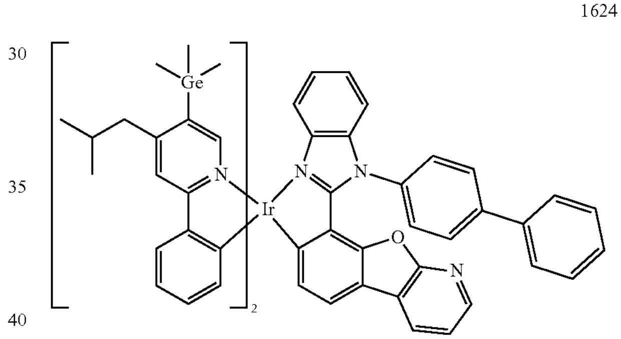
1625
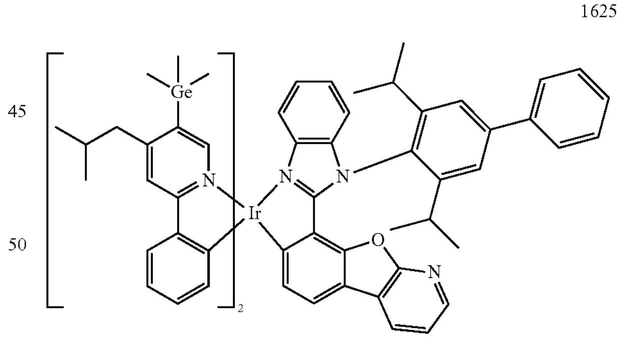
1626
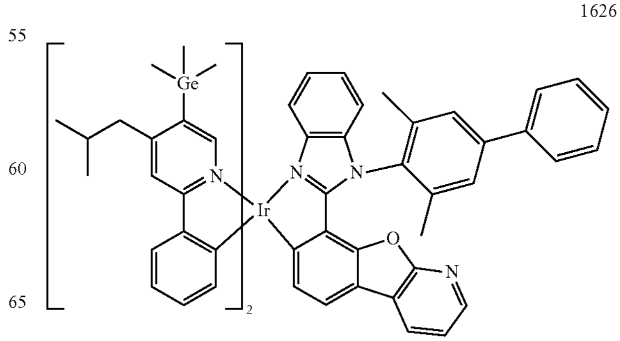

-continued
1627
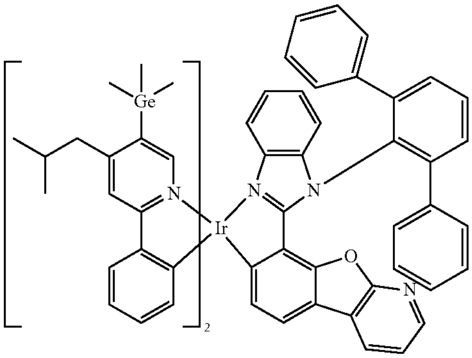
1628
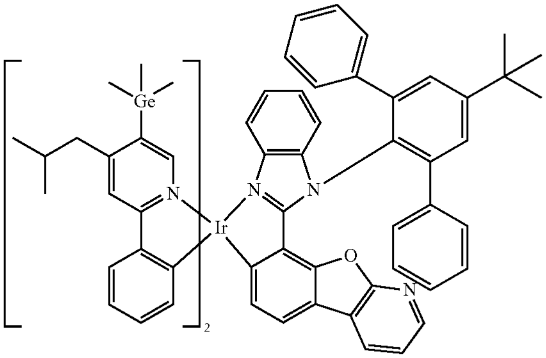
1629
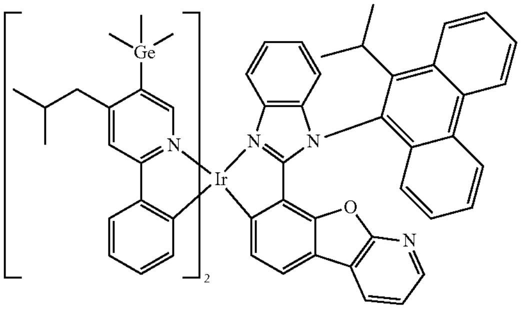
1630
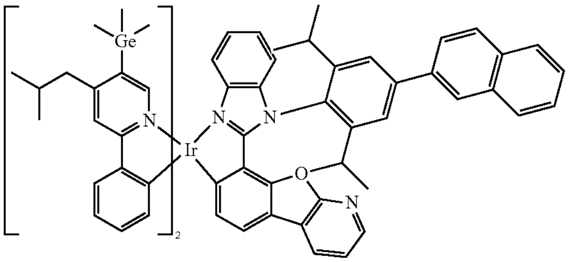
-continued
1631
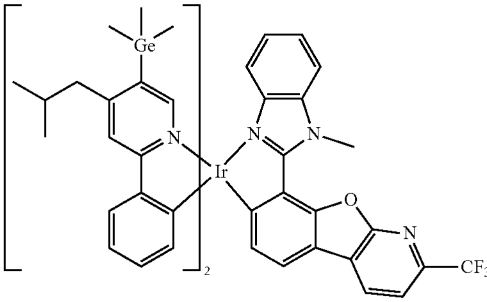
1632
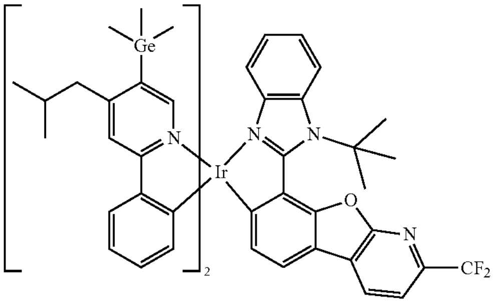
1633
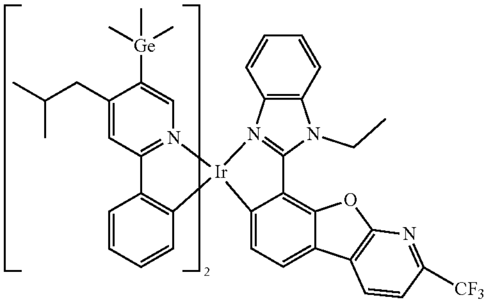
1634
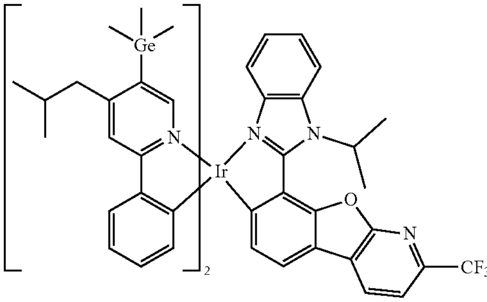
1635
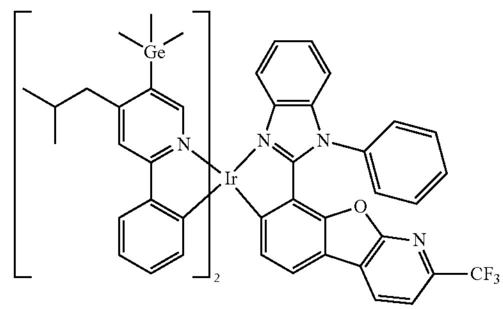

-continued
1636
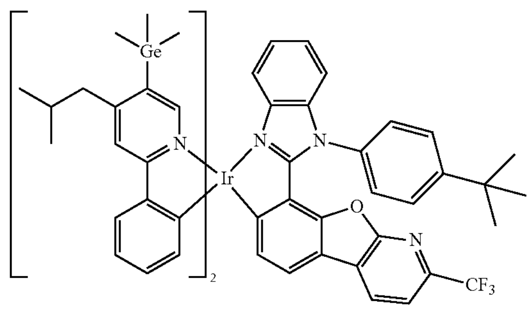
1637
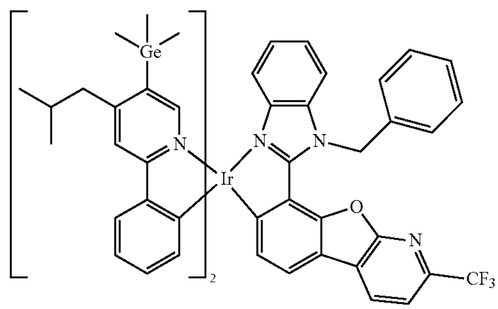
1638
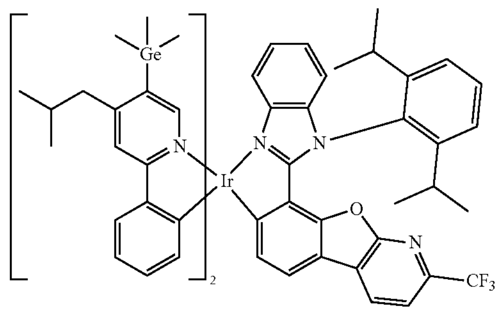
1639
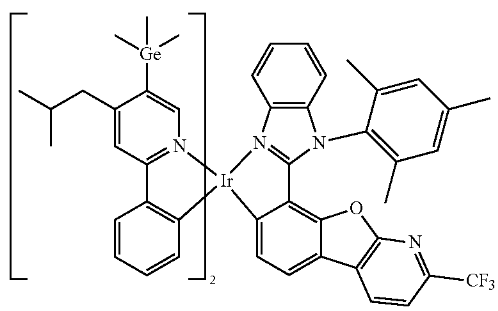
1640
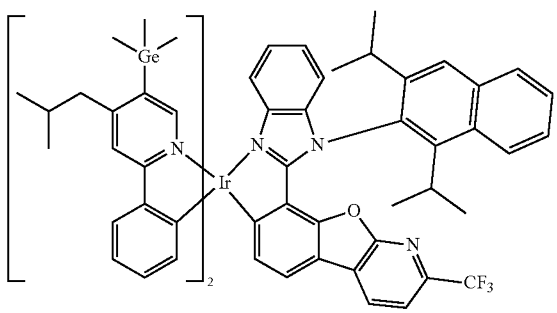
-continued
1641
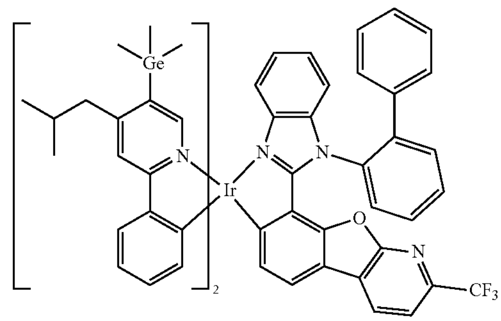
1642
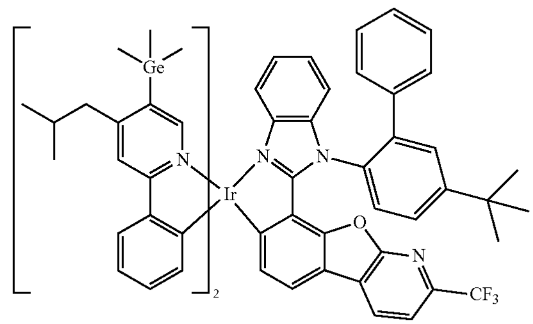
1643
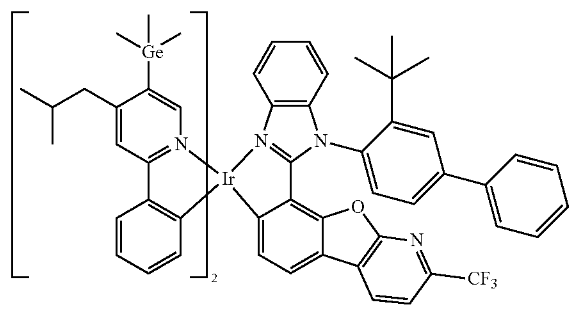
1644
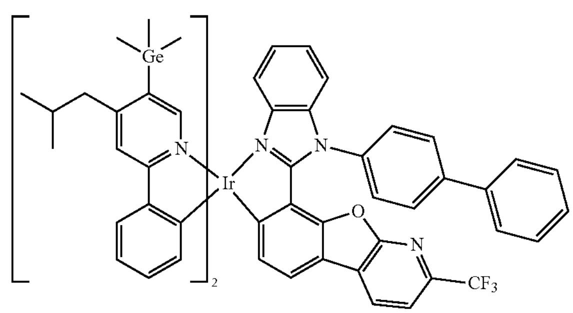

-continued
1645
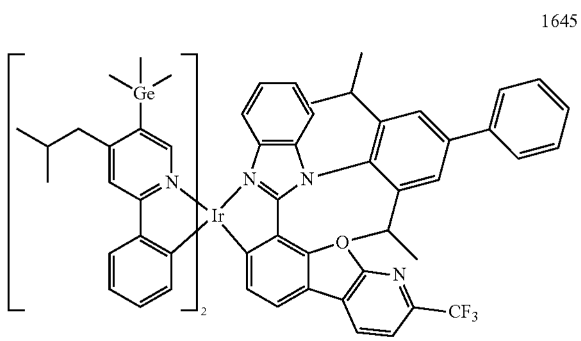
1646
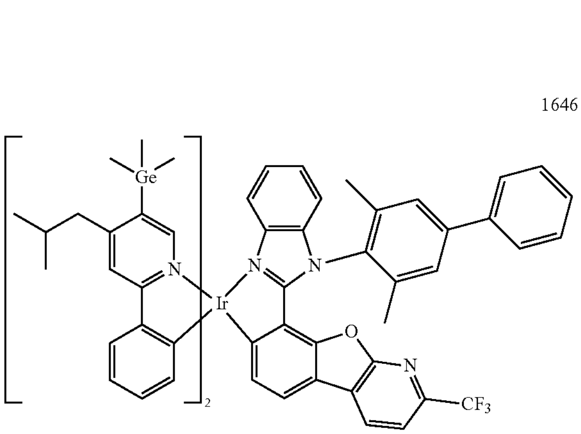
1647
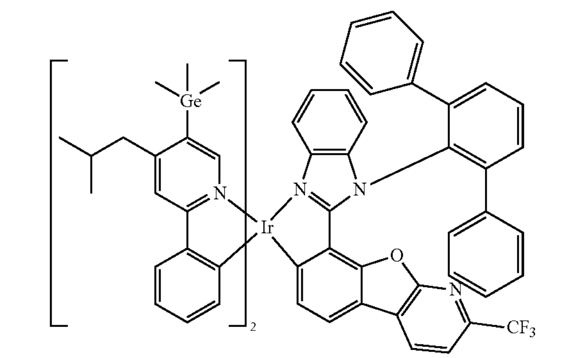
1648
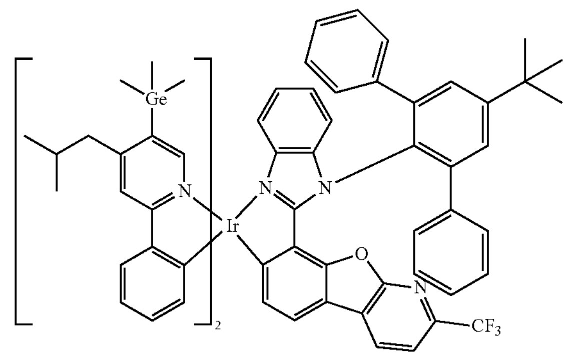
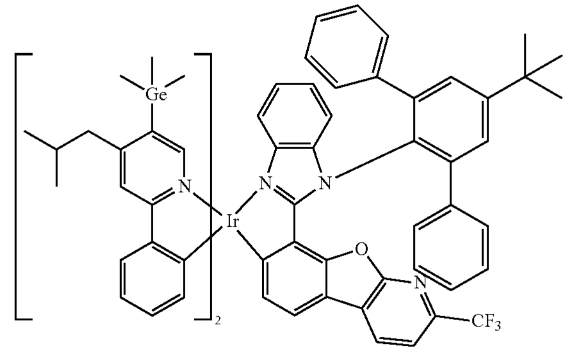
-continued
1649
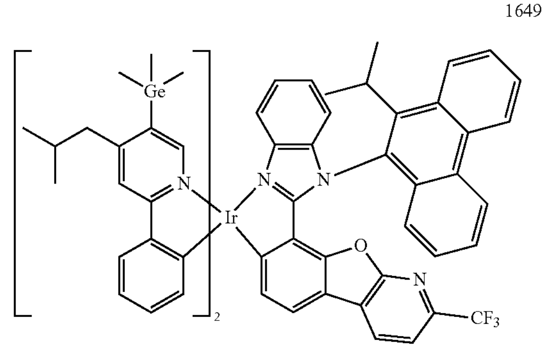
1650
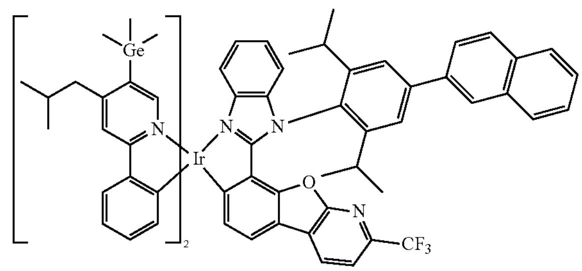
1651
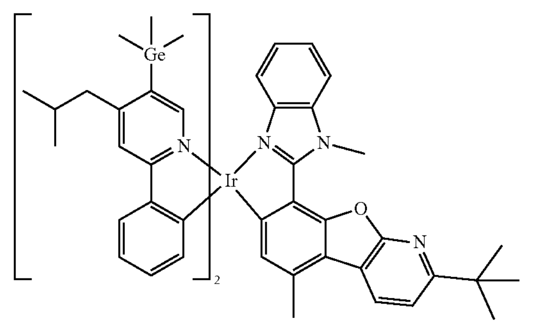
1652
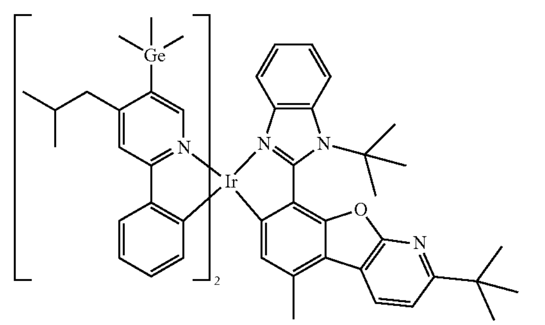
1653
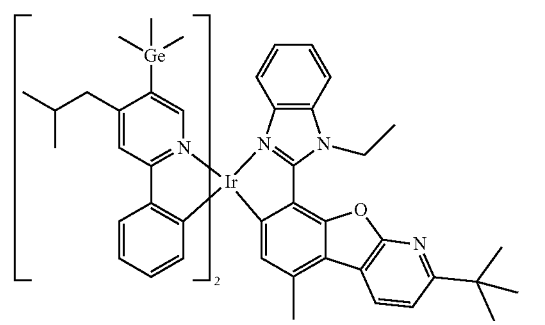

-continued
1654
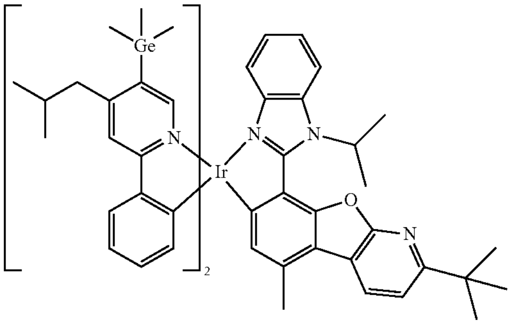
1655
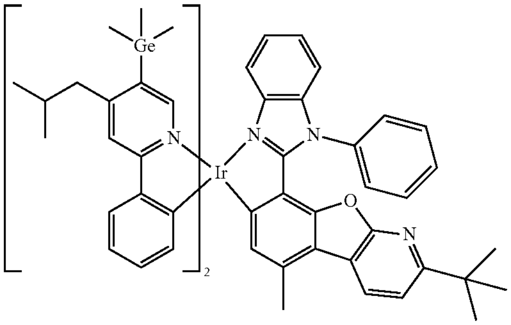
1656
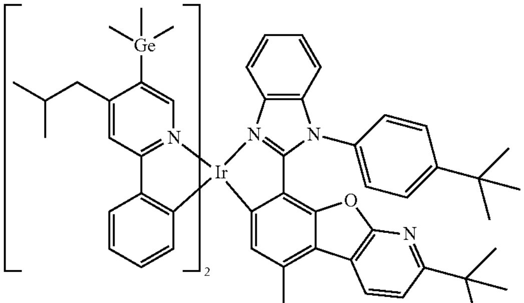
1657
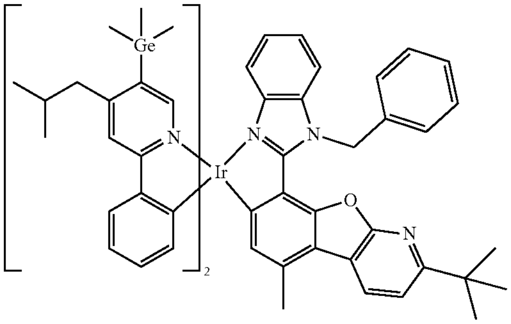
-continued
1658
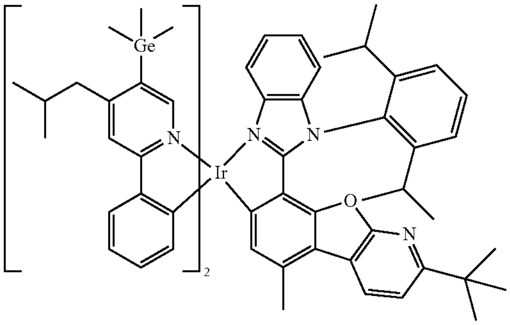
1659
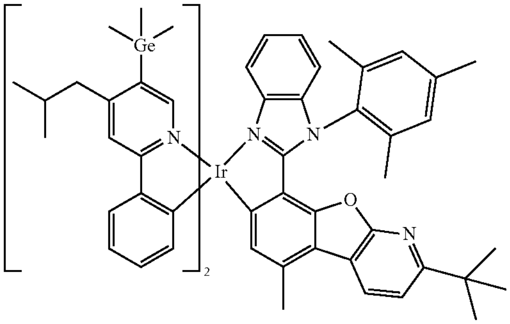
1660
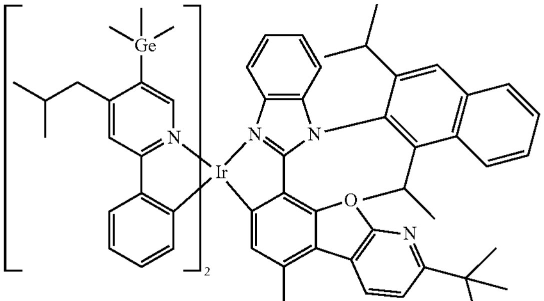
1661
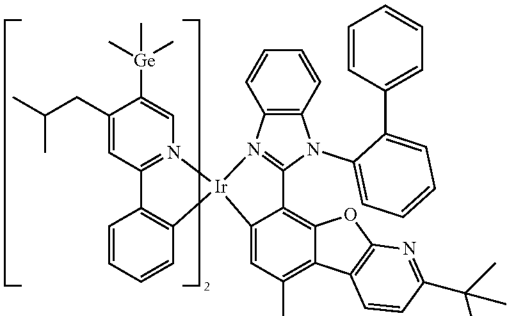

-continued
1662
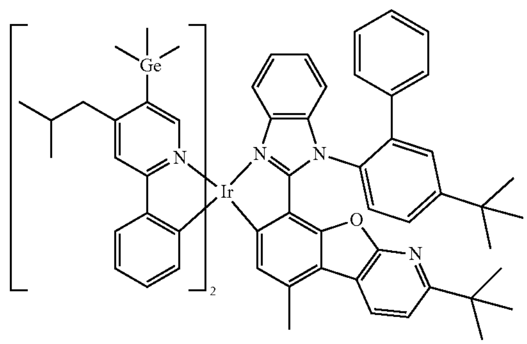
1663
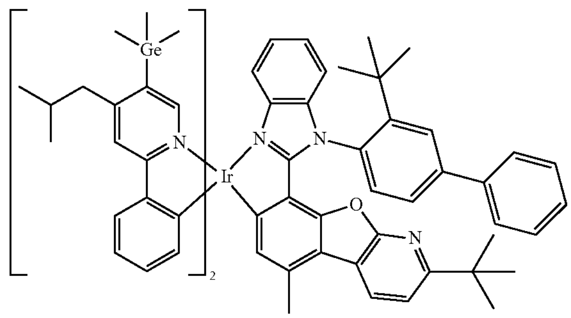
1664
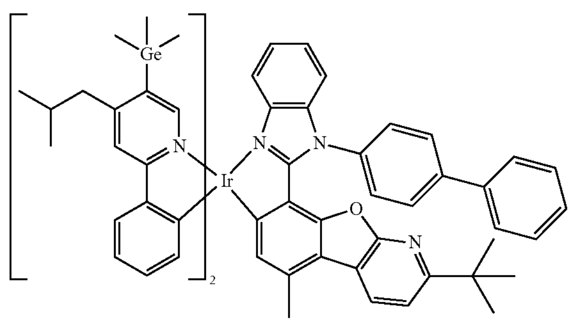
1665
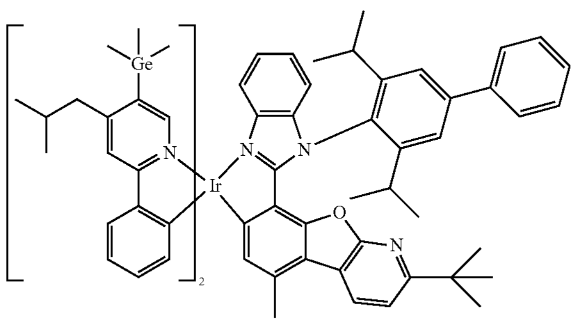
-continued
1666
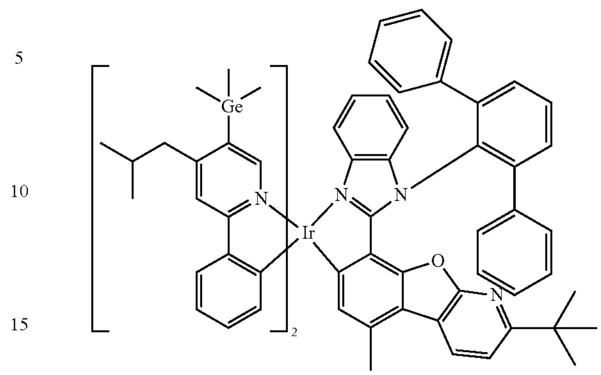
1667
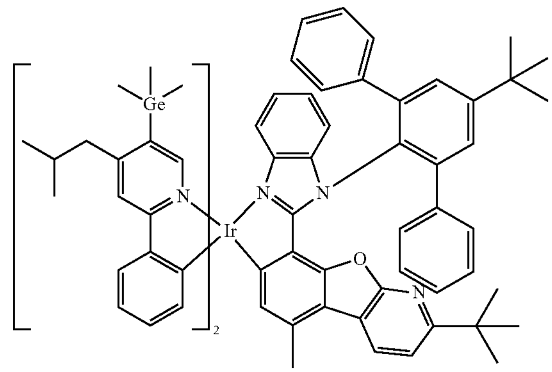
1668
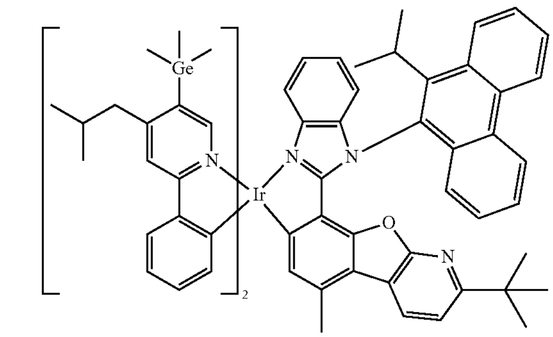
1669
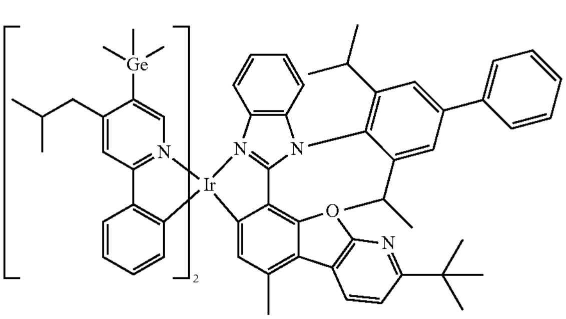

-continued
1670
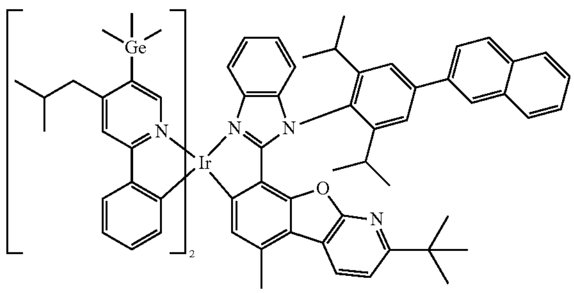
1671
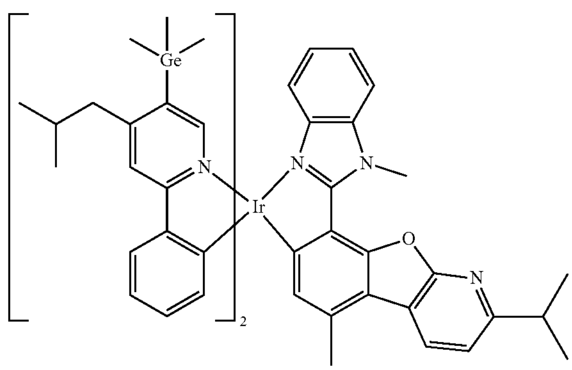
1672
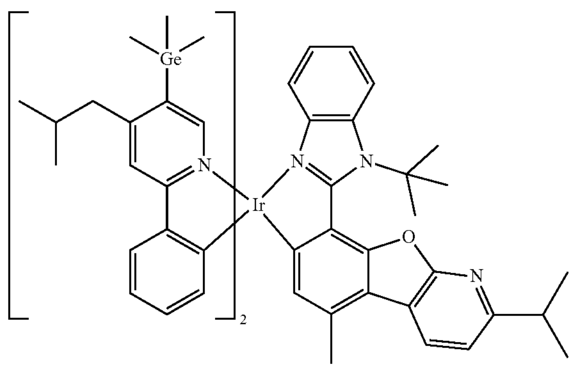
1673
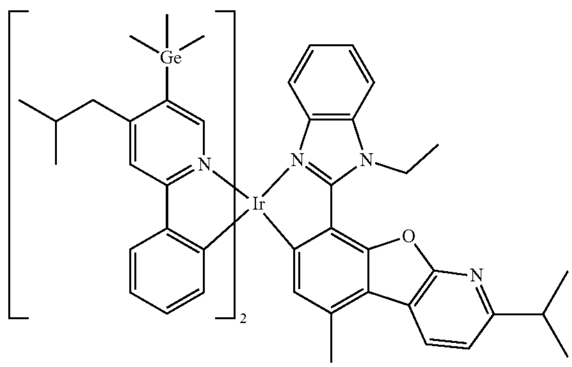
-continued
1674
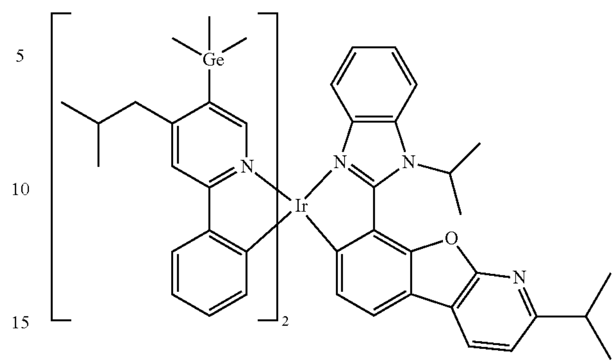
1675
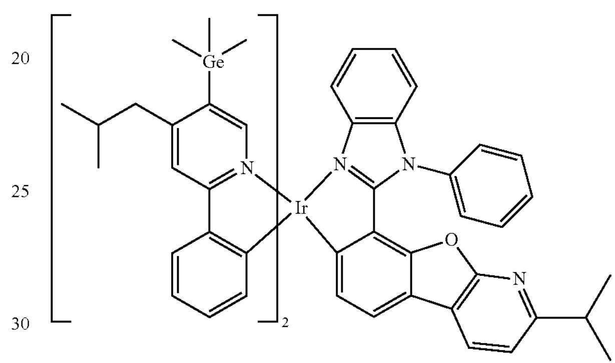
1676
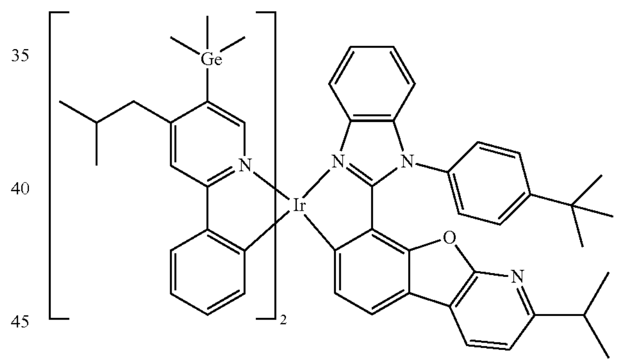
1677
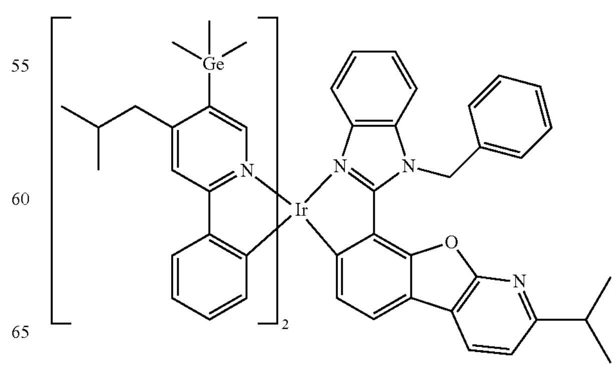

-continued
1678
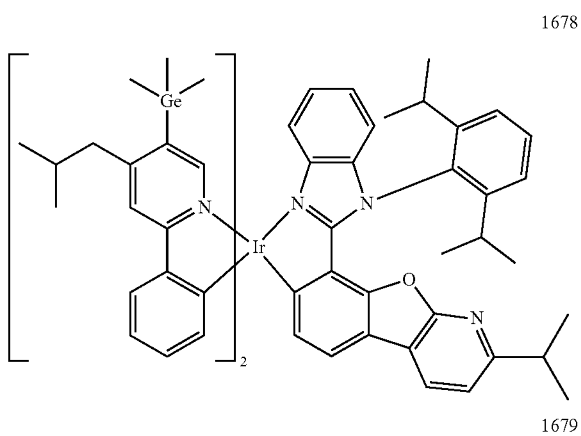
1679
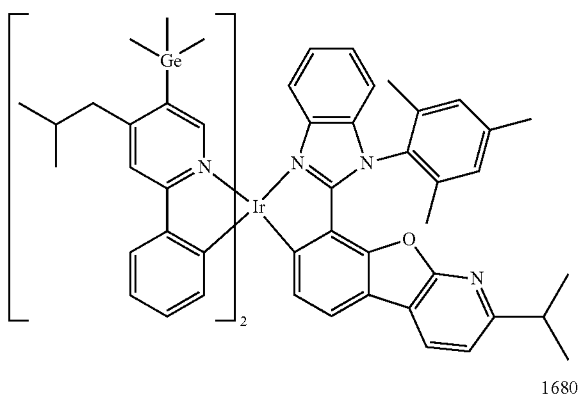
1680
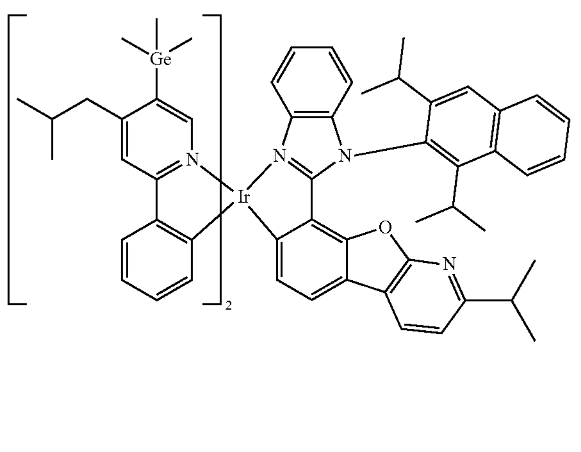
1681
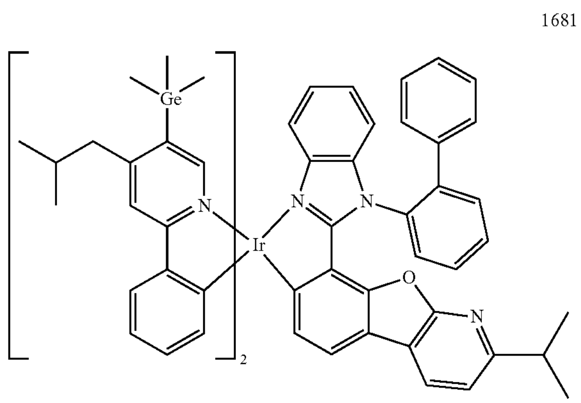
-continued
1682
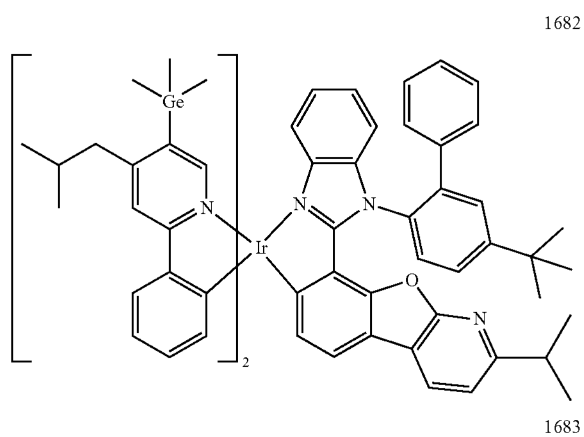
1683
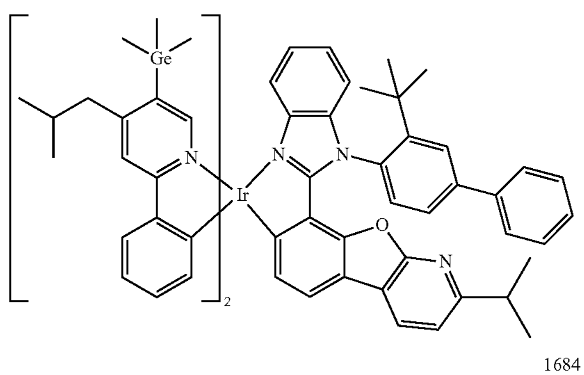
1684
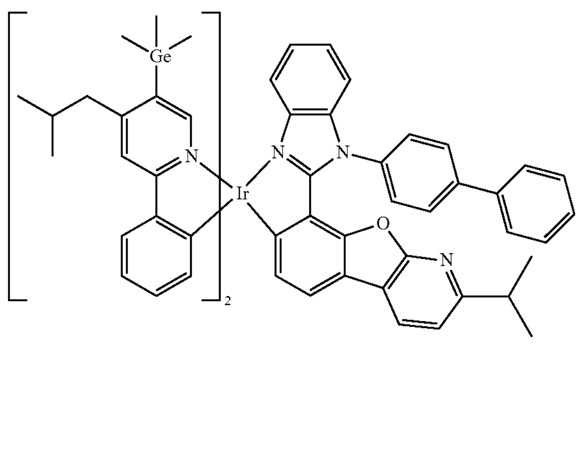
1685
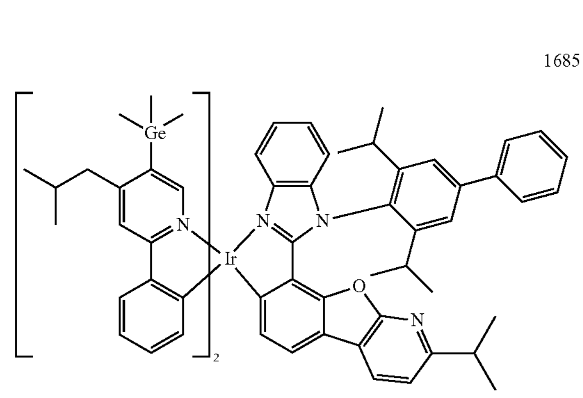

-continued
1686
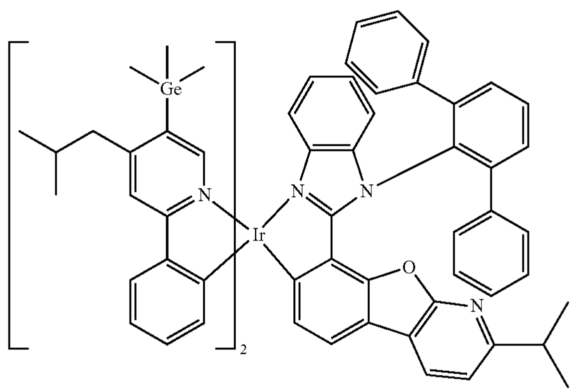
1687
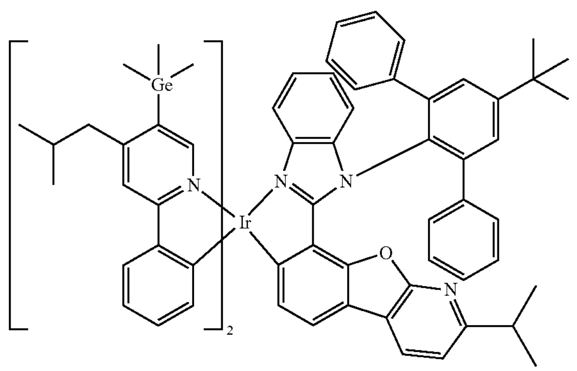
1688
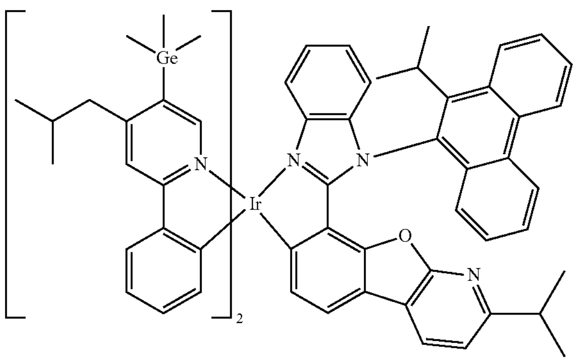
1689
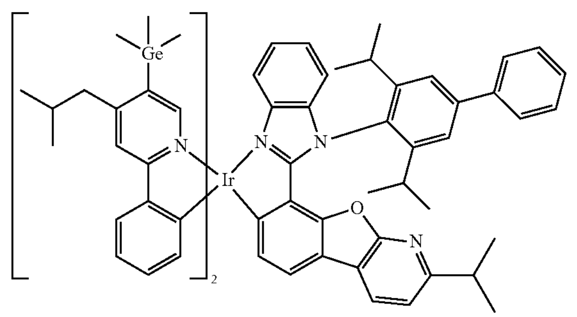
-continued
1690
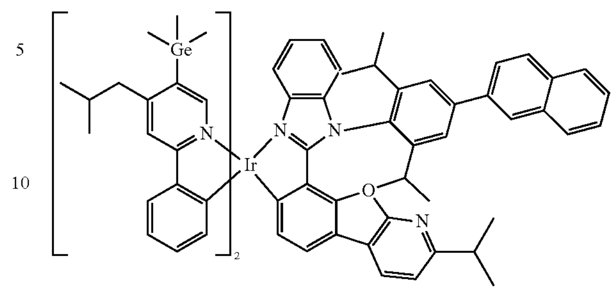
1691
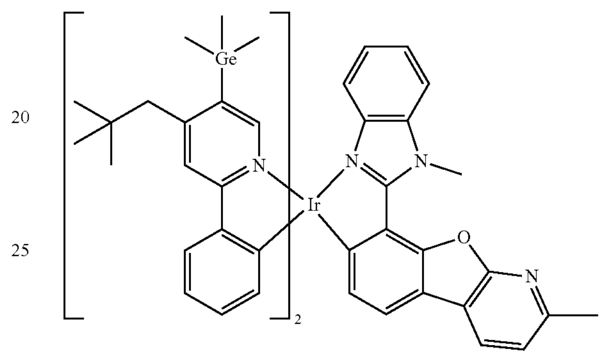
1692
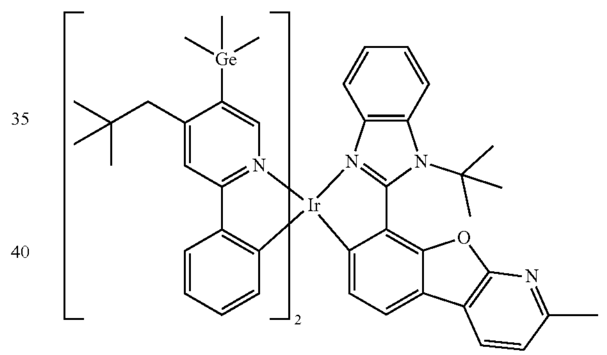
1693
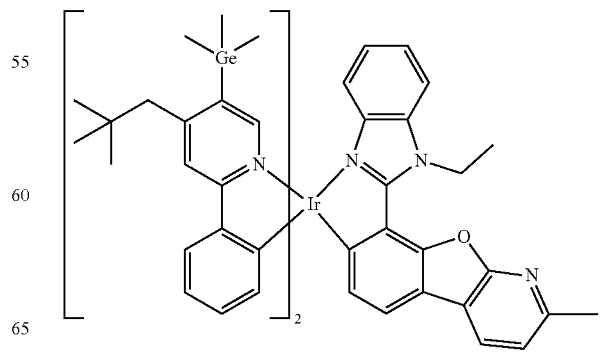

-continued
1694
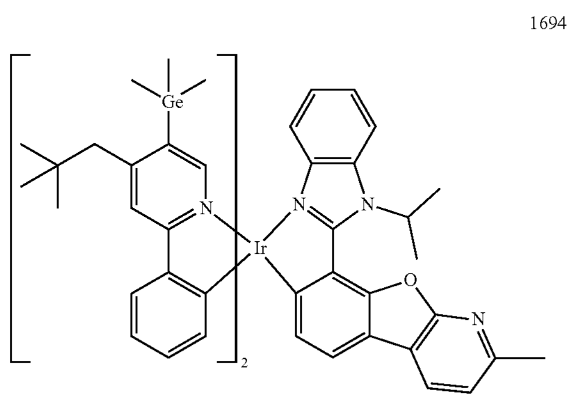
1695
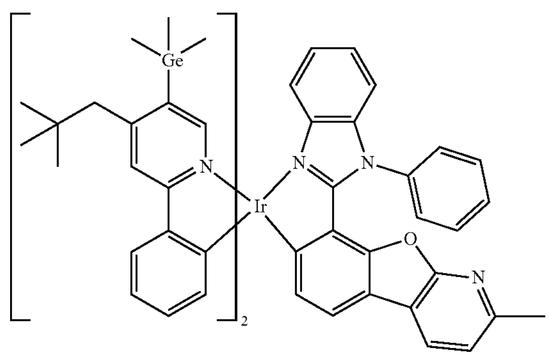
1696
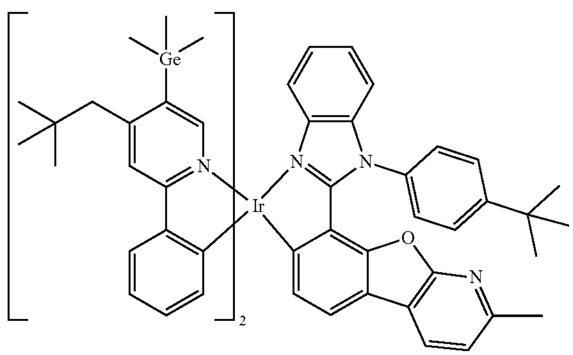
1697
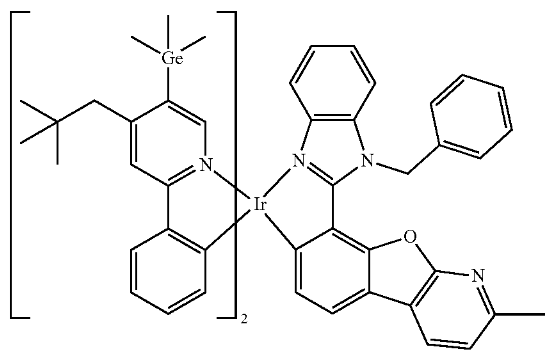
-continued
1698
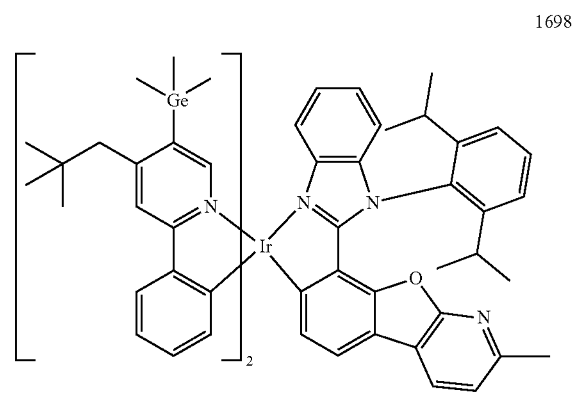
1699
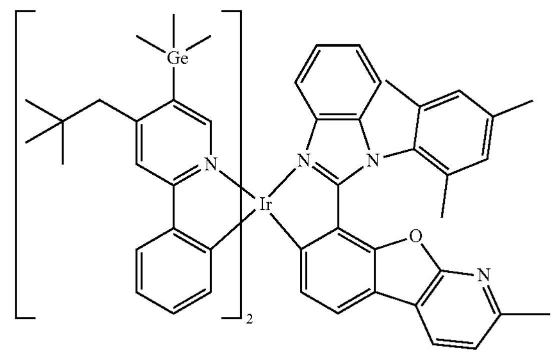
1700
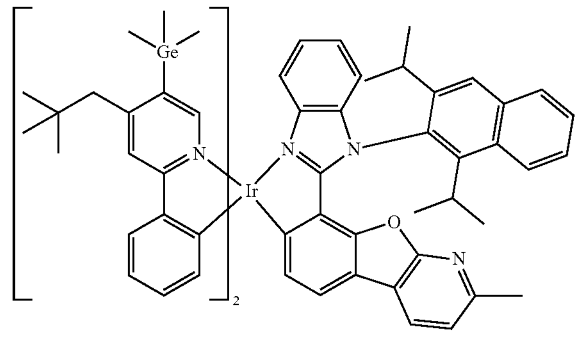
1701
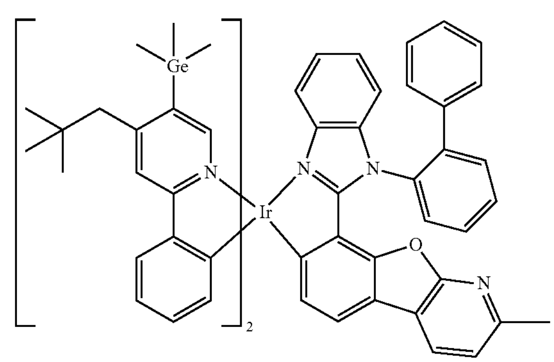

-continued
1702
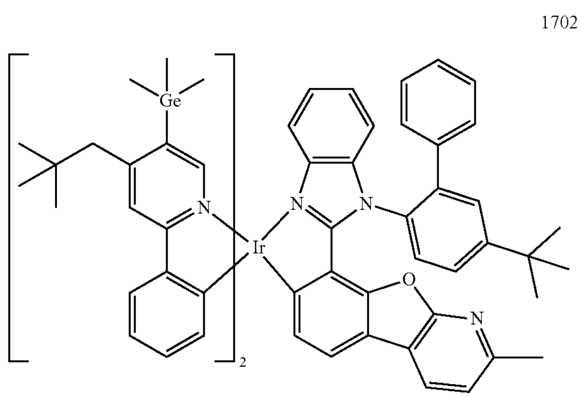
1703
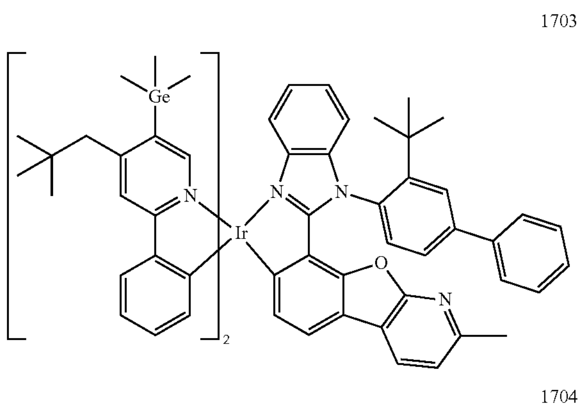
1704
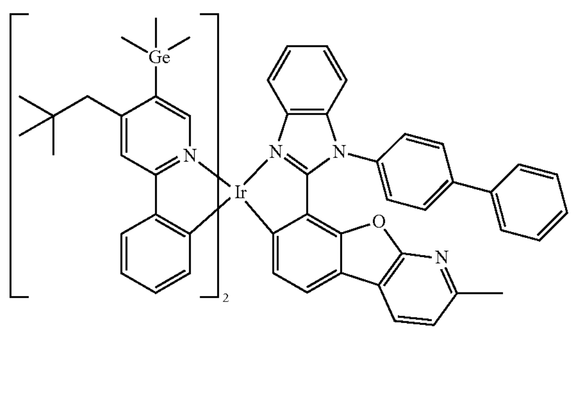
1705
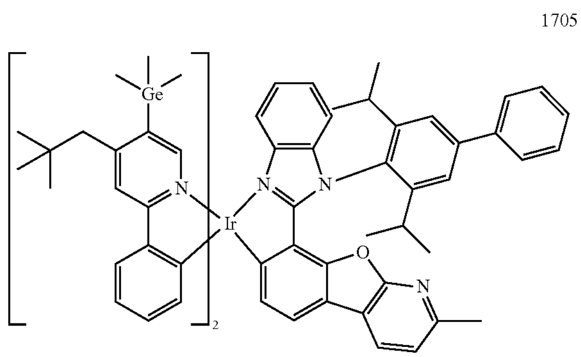
-continued
1706
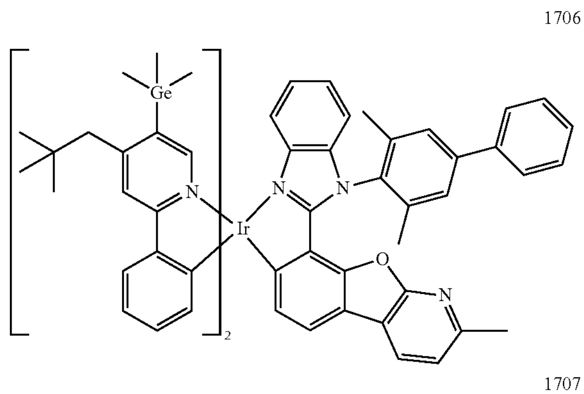
1707
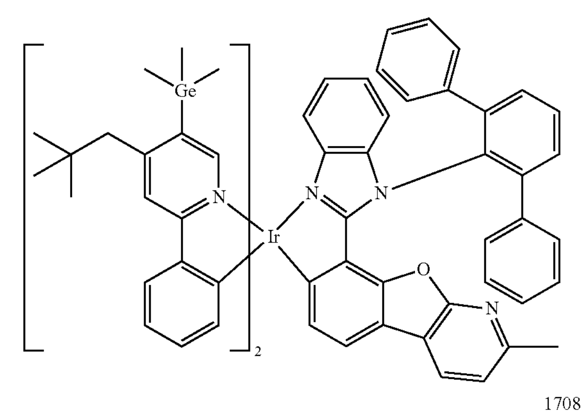
1708
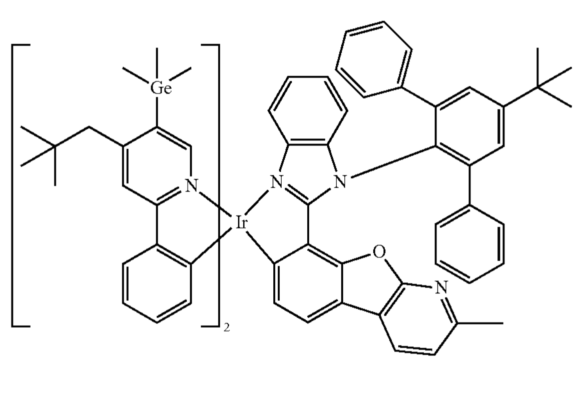
1709
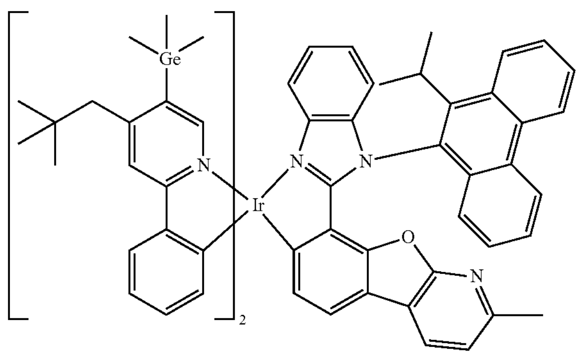

-continued
1710
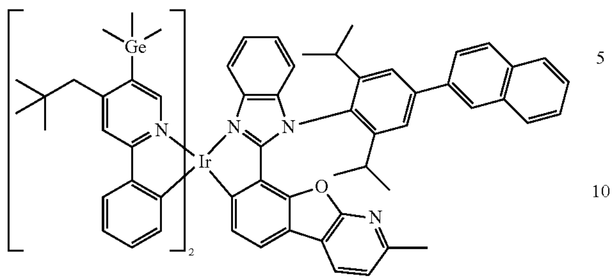
1711
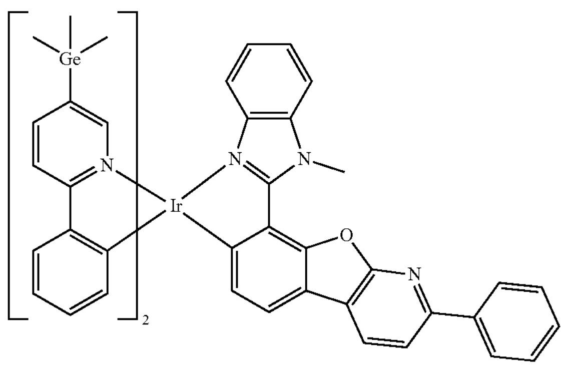
1712
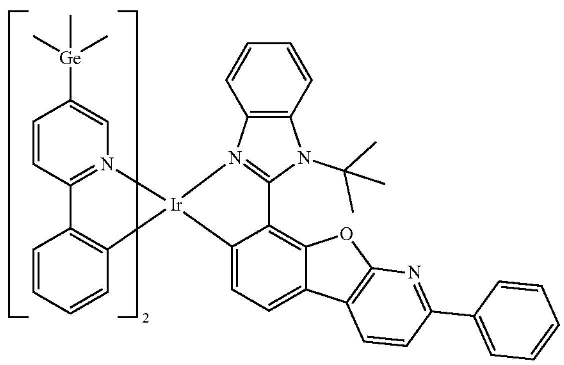
1713
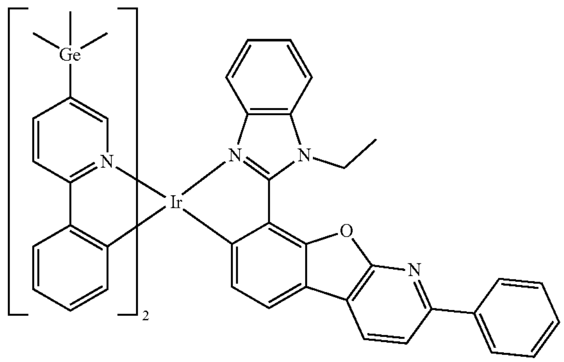

-continued
1714
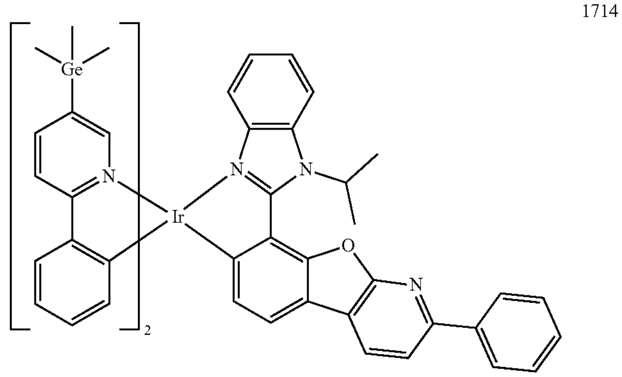
1715
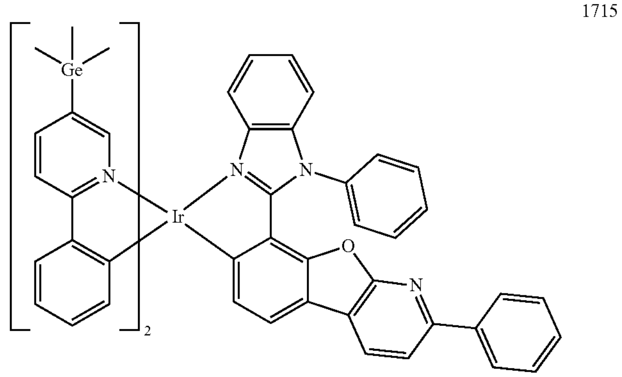
1716
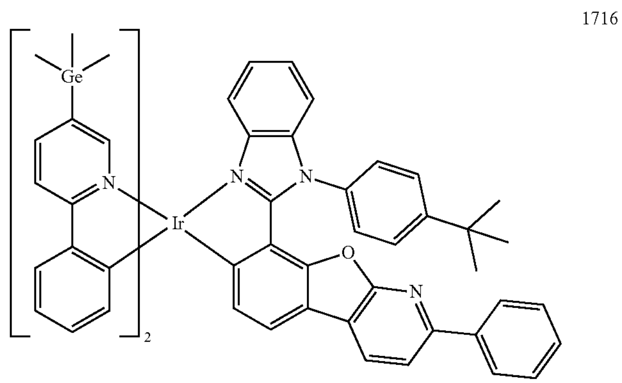
1717
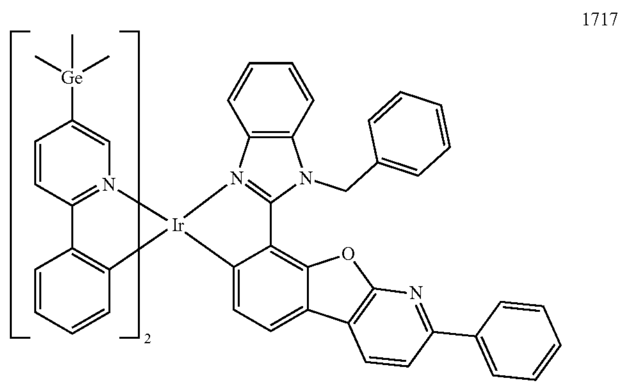

-continued
1718
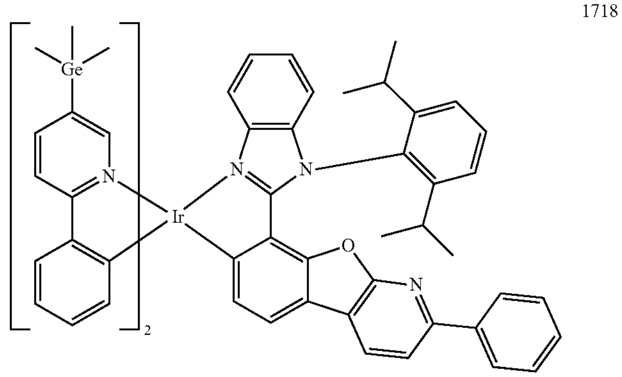
1719
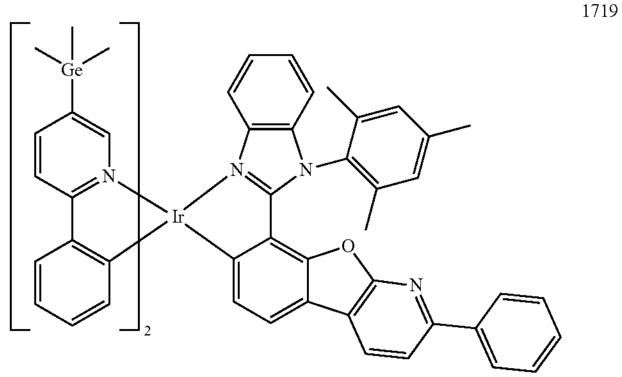
1720
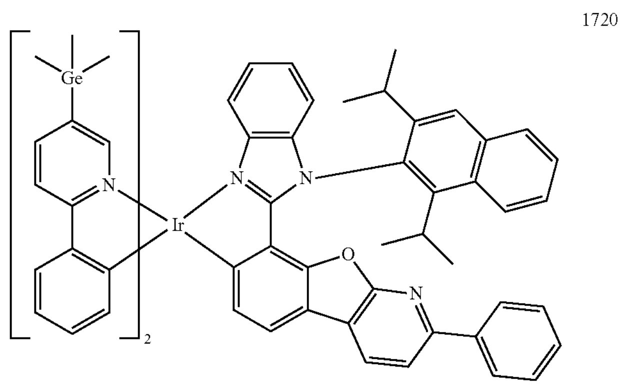
1721
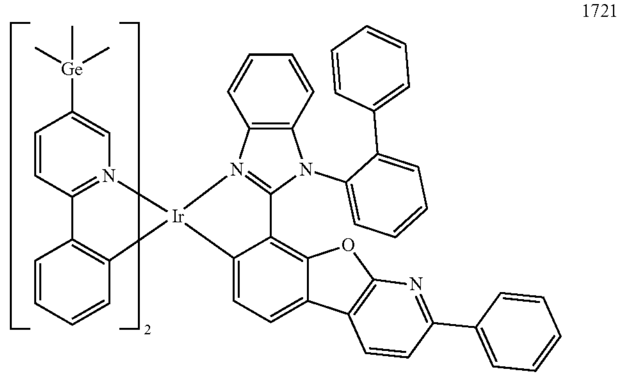

-continued
1722
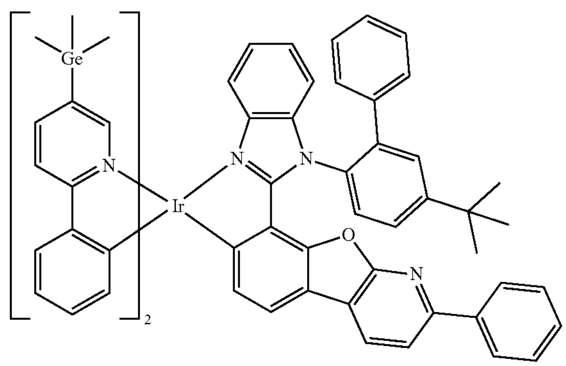
1723
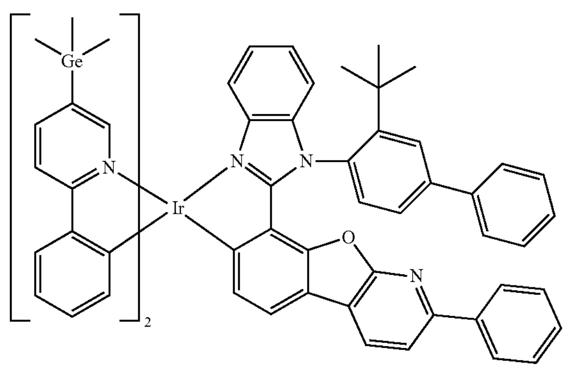
1724
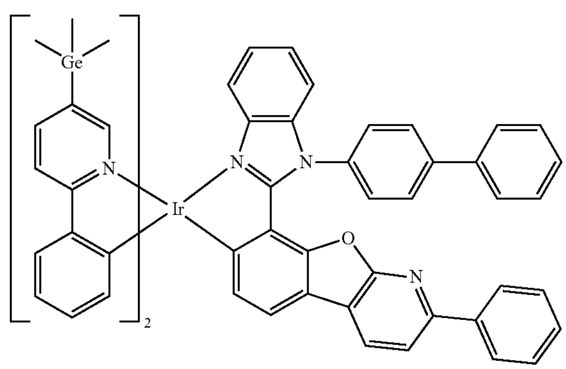
1725
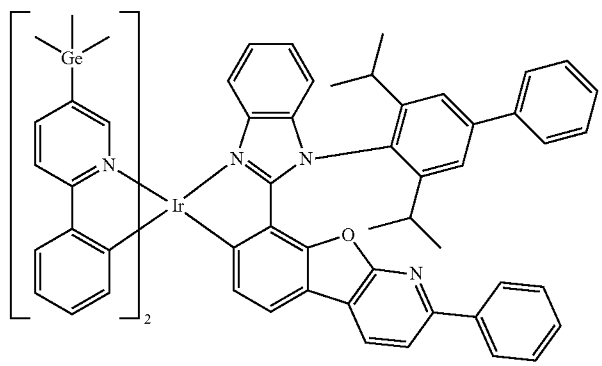

-continued
1726
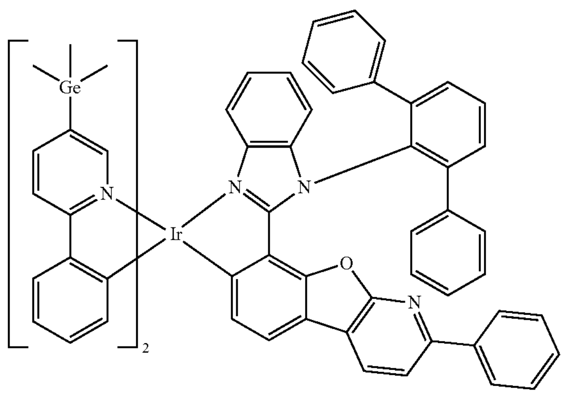
1727
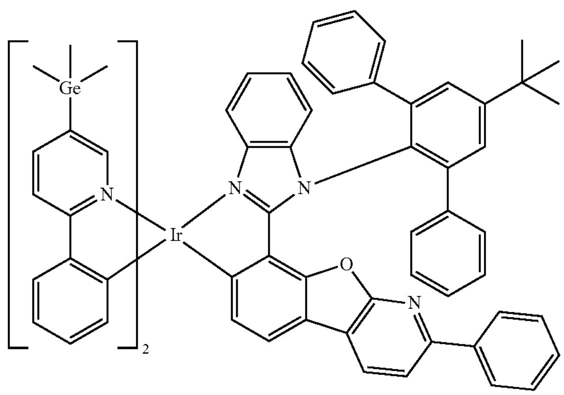
1728
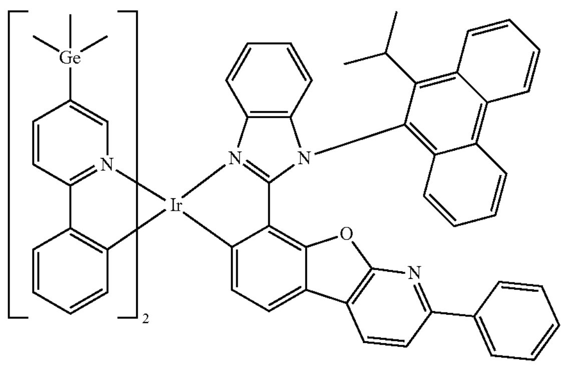
1729
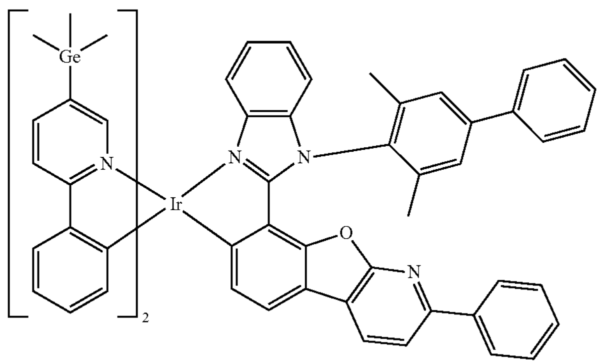

-continued
1730
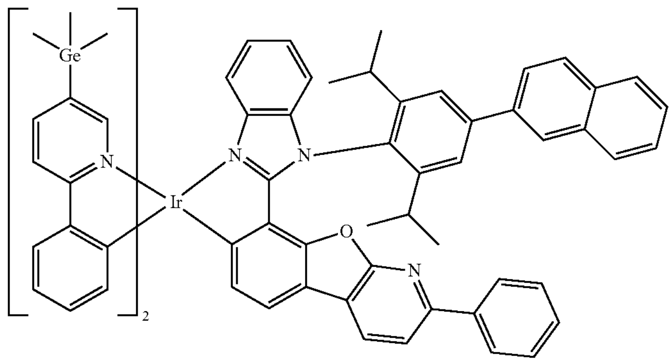
1731
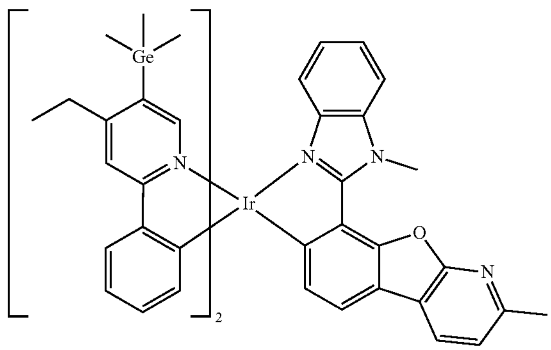
1732
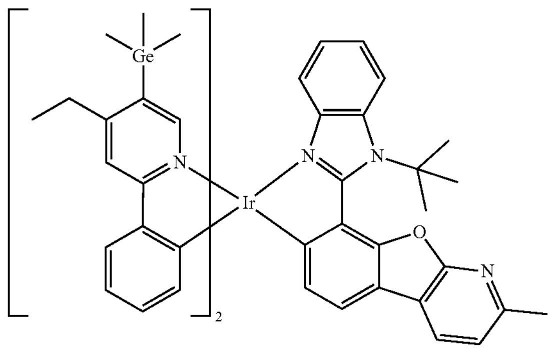
1733
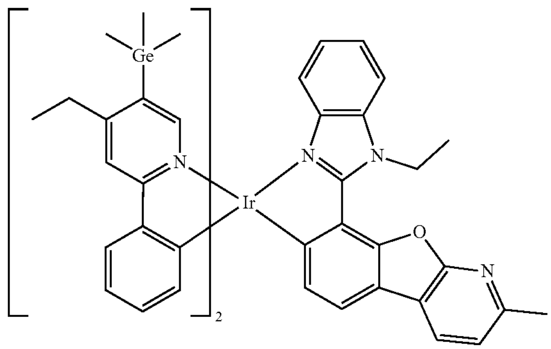

-continued
1734
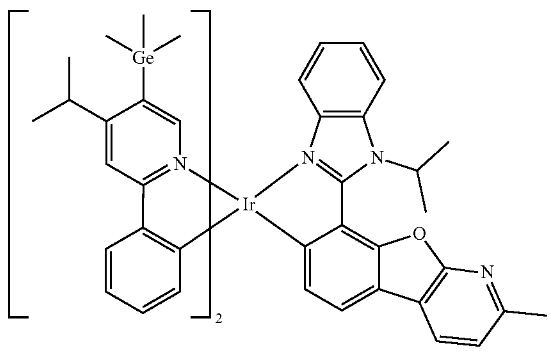
1735
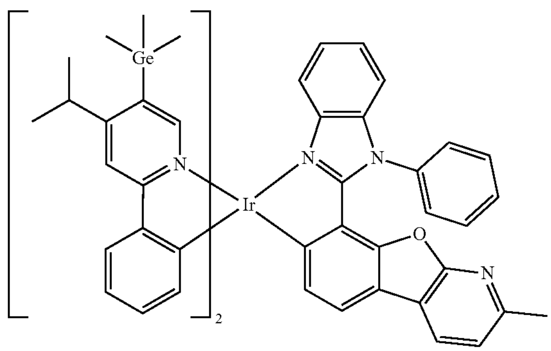
1736
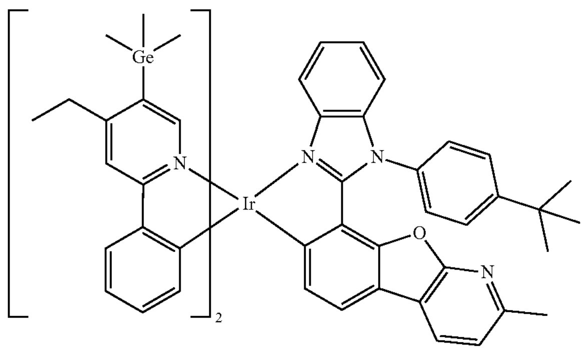
1737
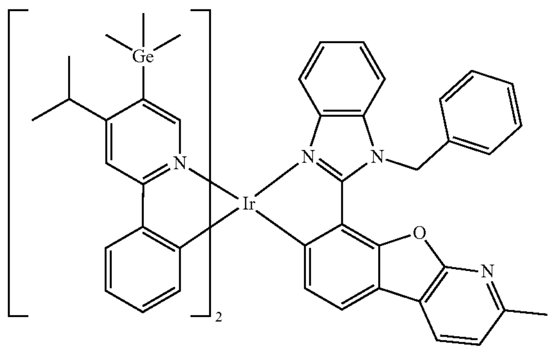

-continued
1738
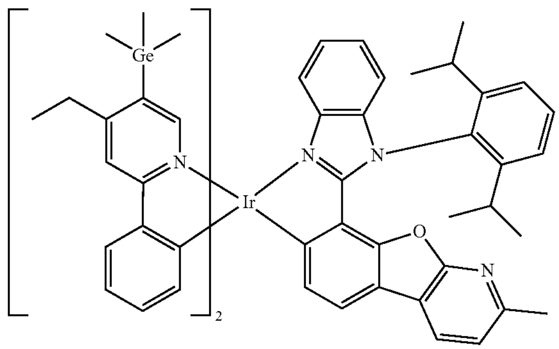
1739
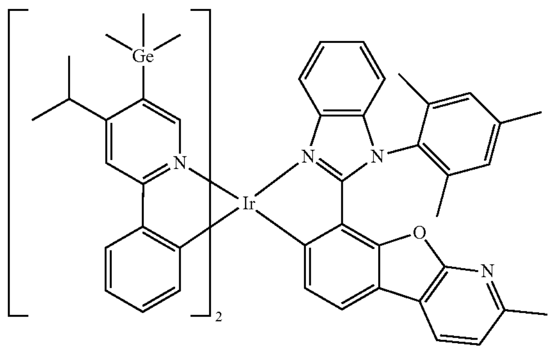
1740
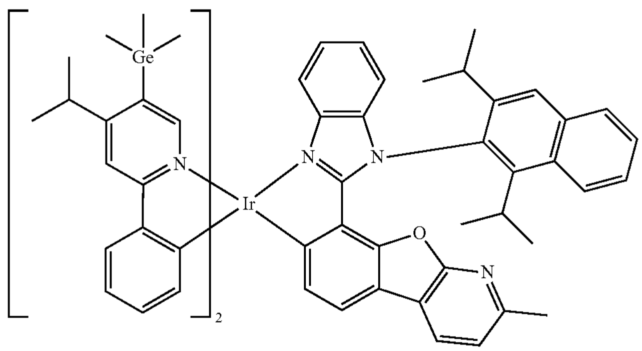
1741
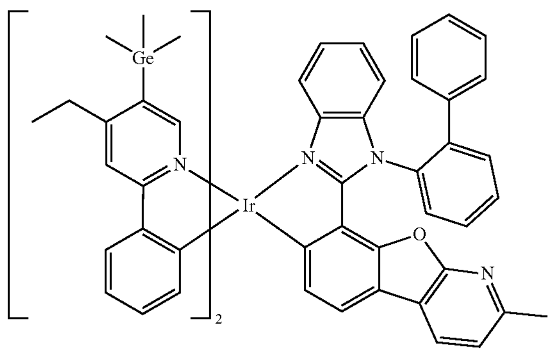

-continued
1742
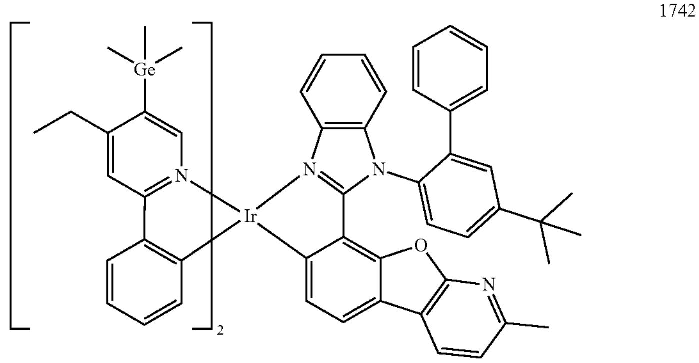
1743
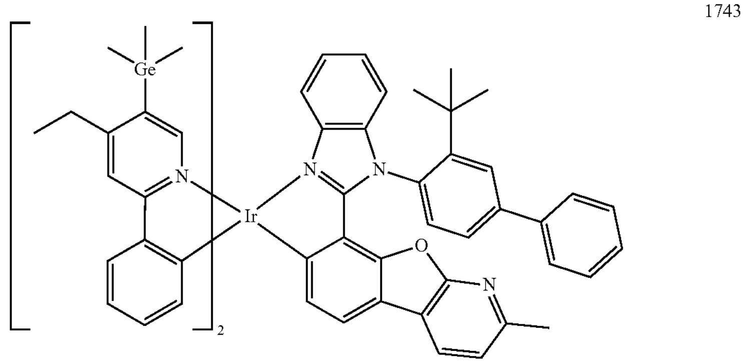
1744
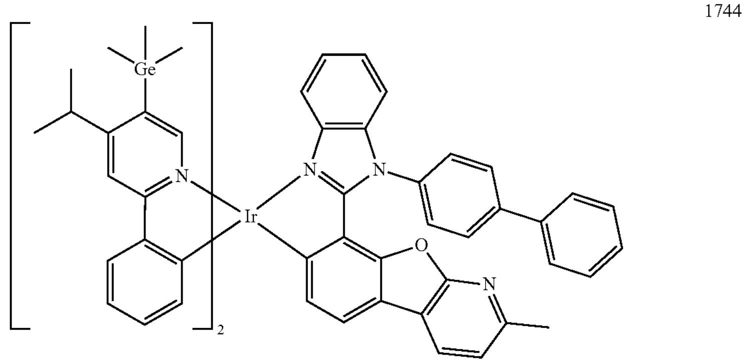
1745
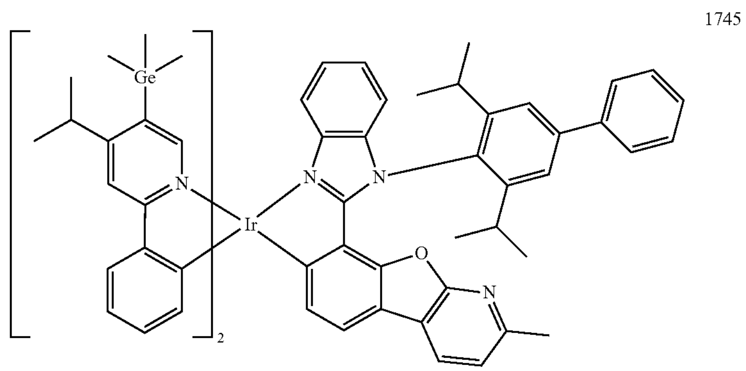

-continued
1746
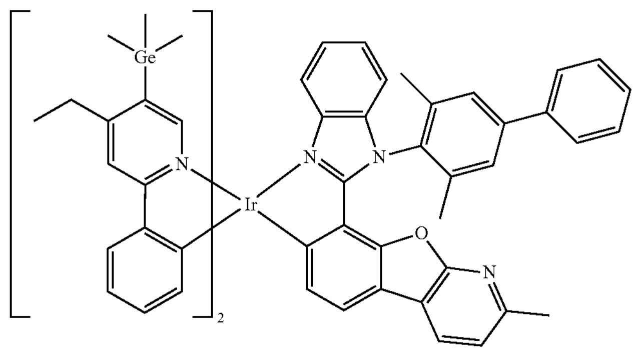
1747
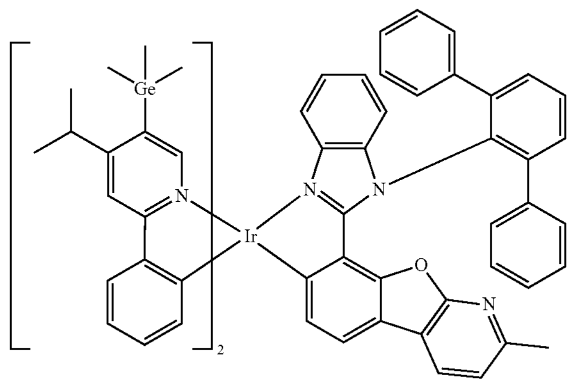
1748
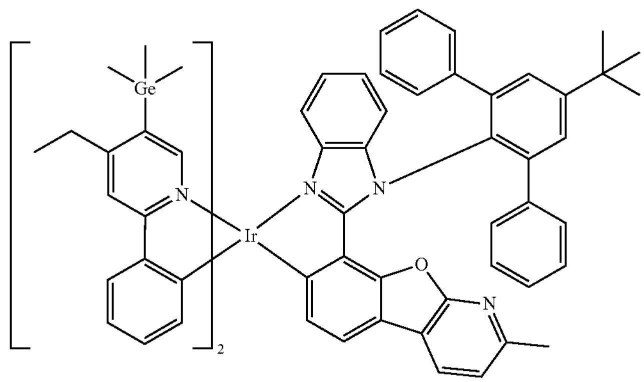
1749
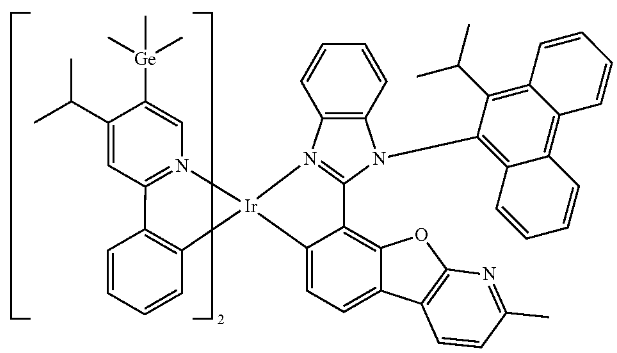

-continued
1750
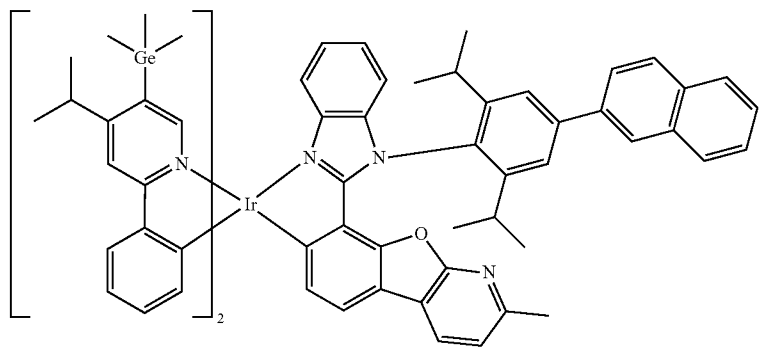
1751
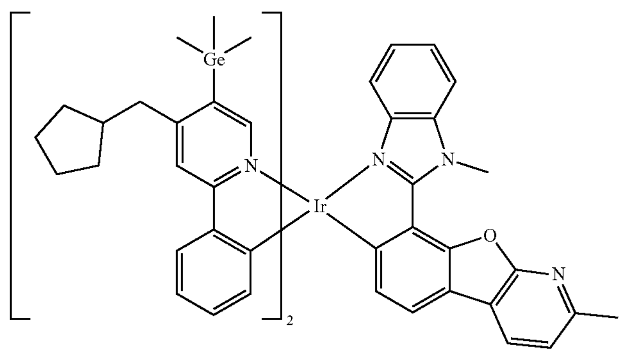
1752
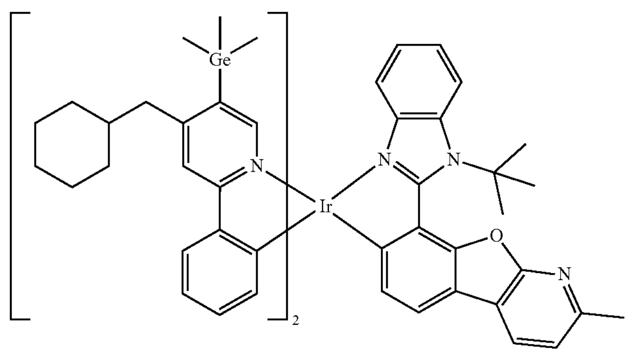
1753
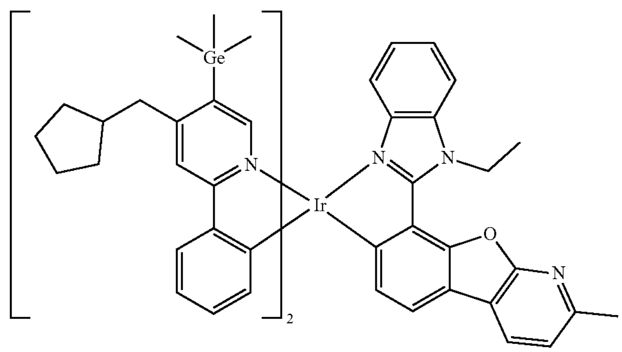

-continued
1754
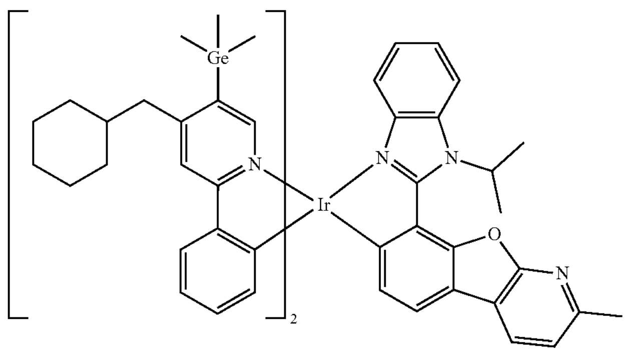
1755
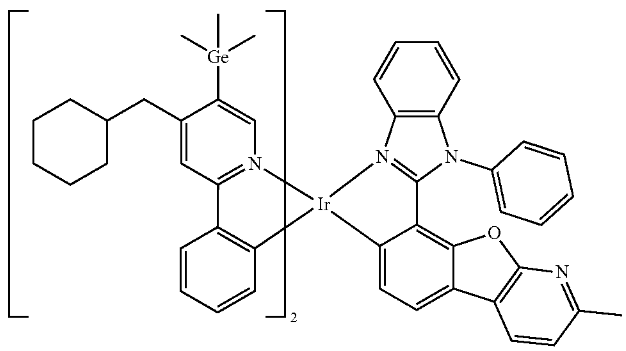
1756
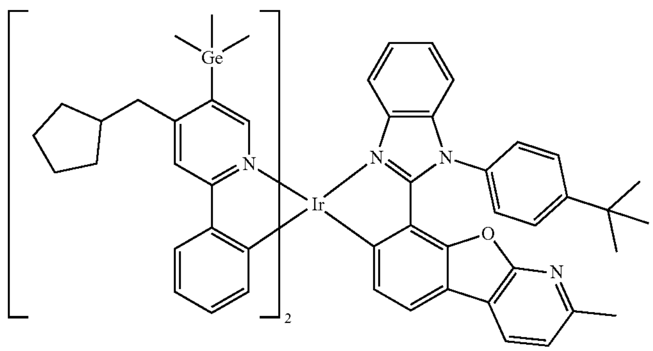
1757
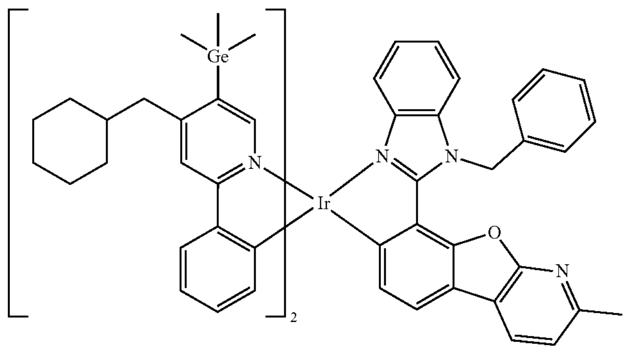

-continued
1758
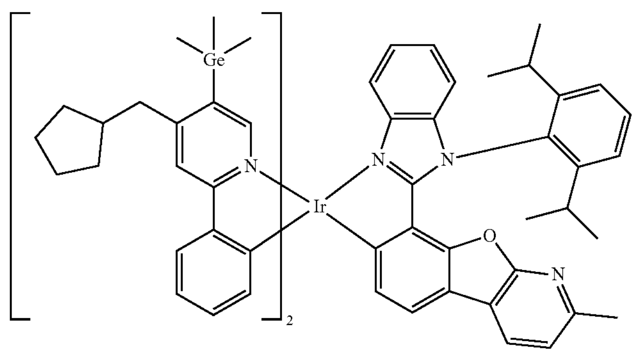
1759
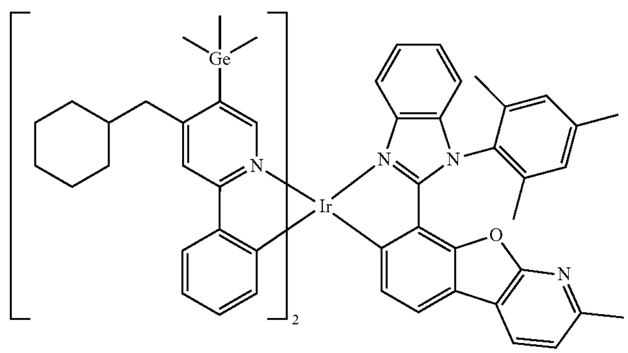
1760
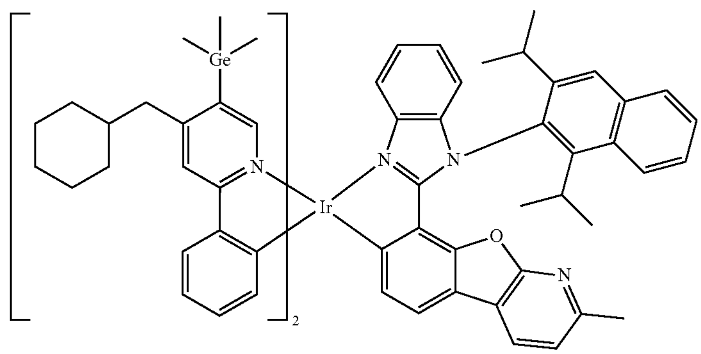
1761
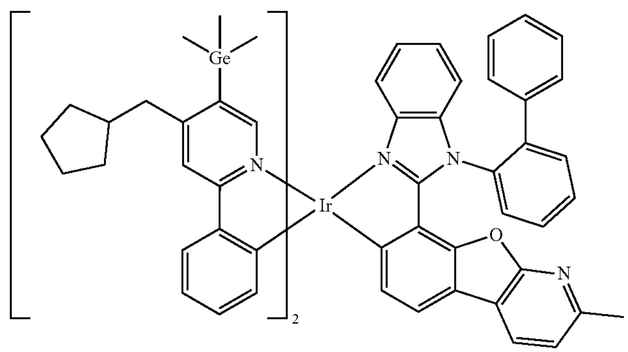

-continued
1762
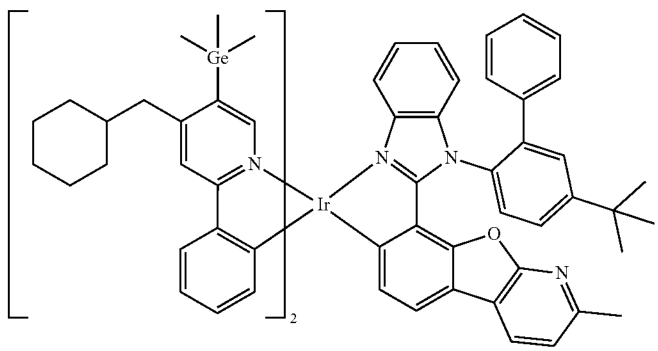
1763
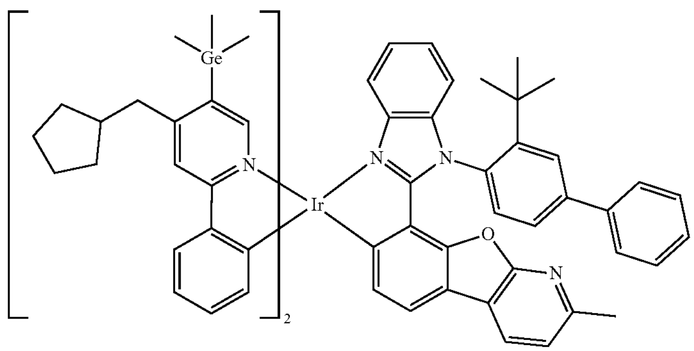
1764
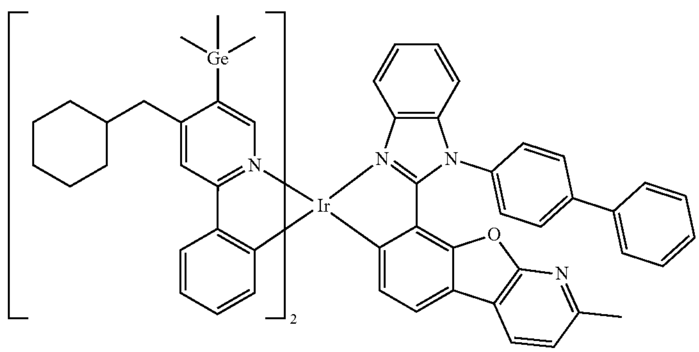
1765
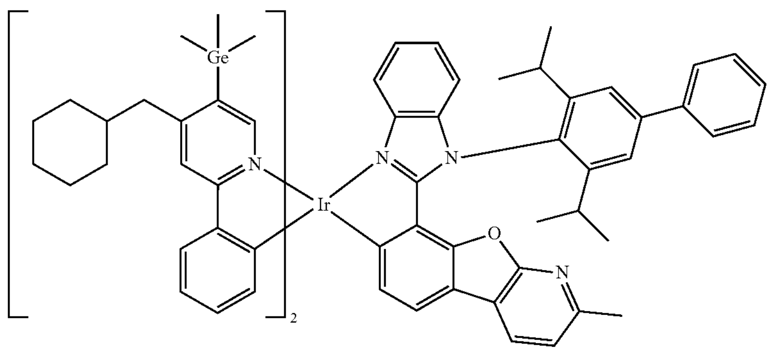

-continued
1766
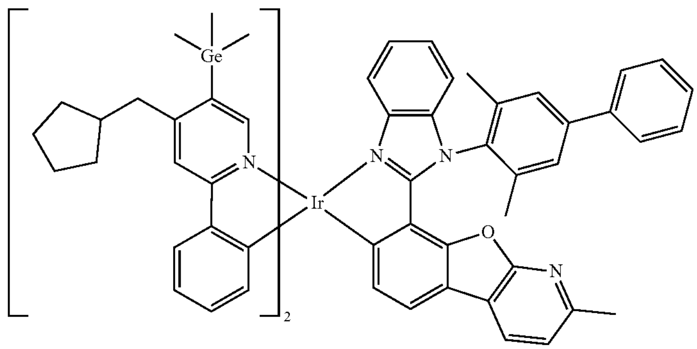
1767
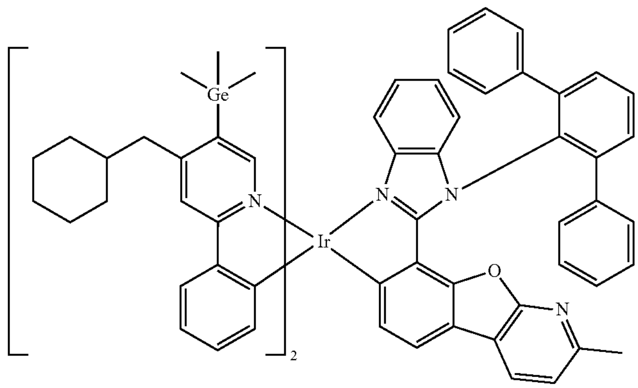
1768
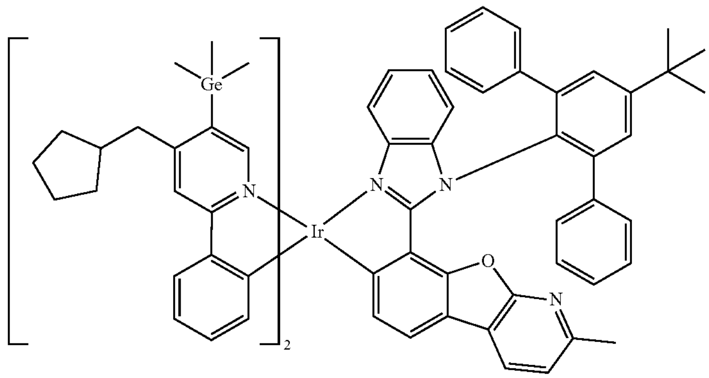
1769
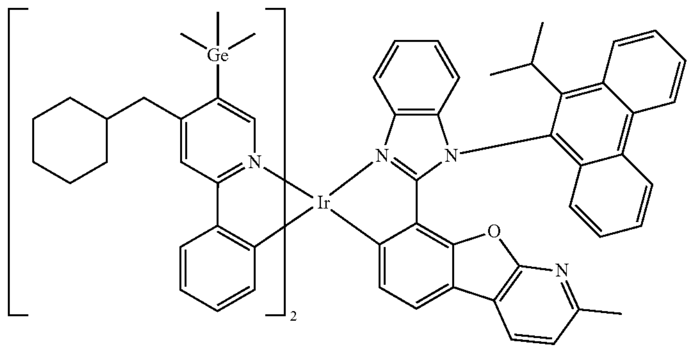

-continued
1770
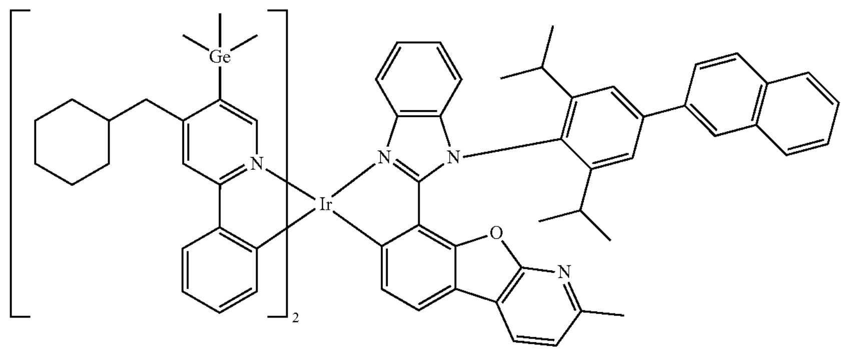
1771
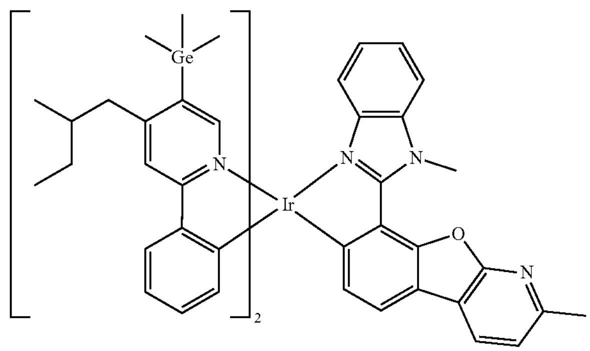
1772
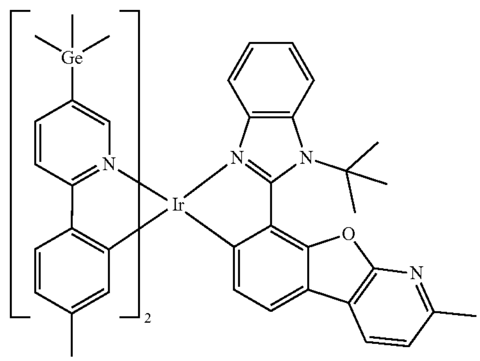
1773
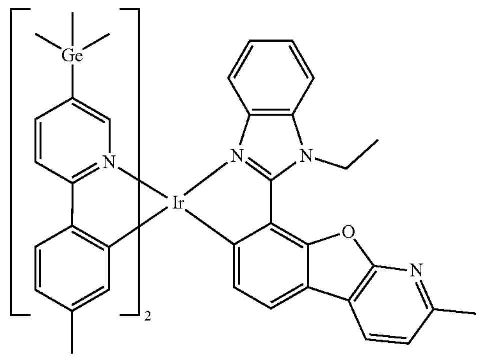

-continued
1774
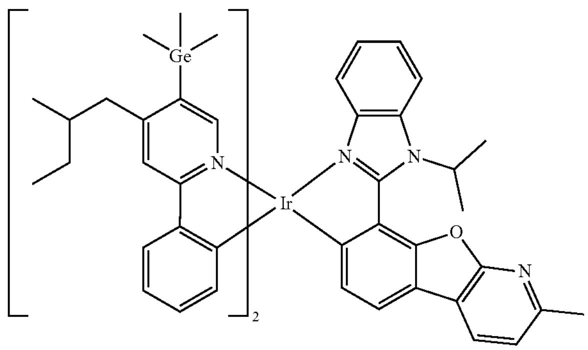
1775
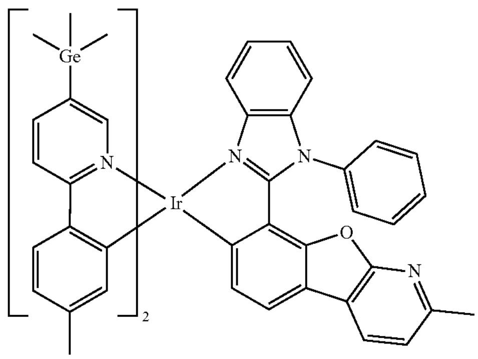
1776
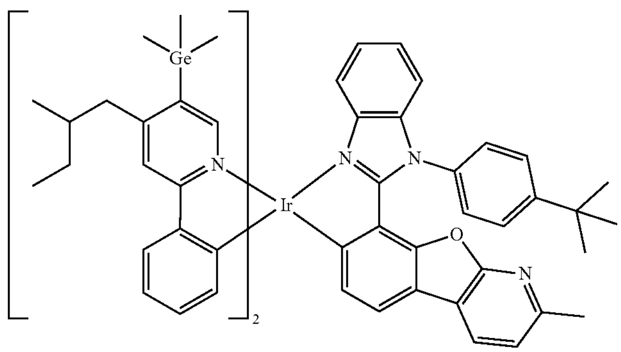
1777
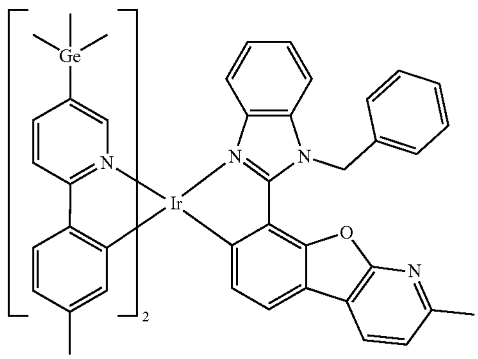

-continued
1778
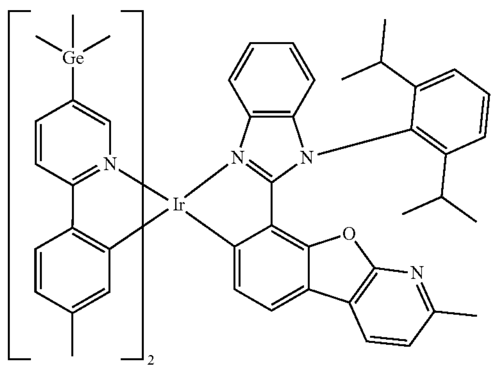
1779
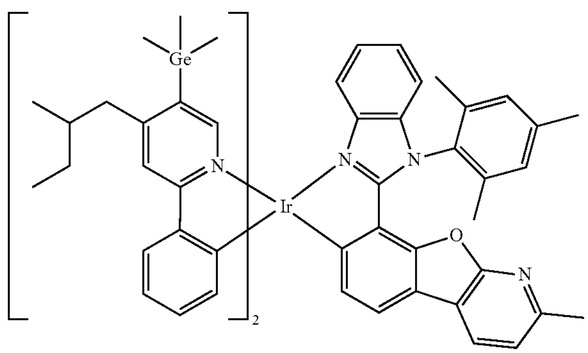
1780
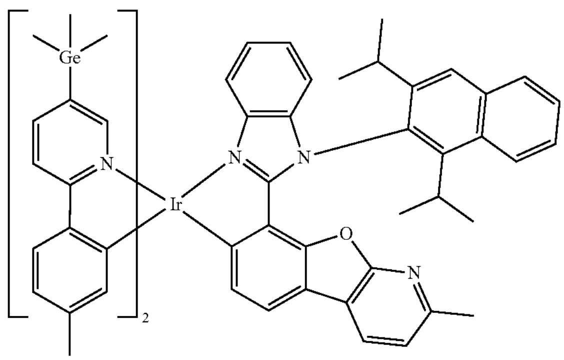
1781
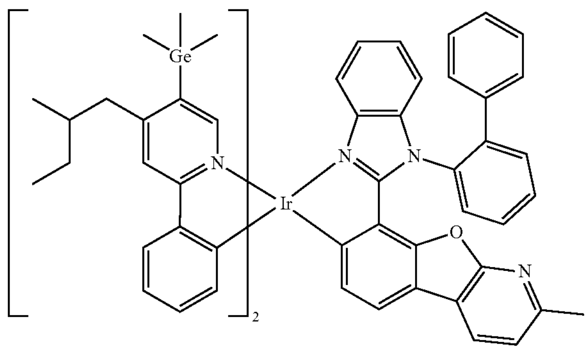

-continued
1782
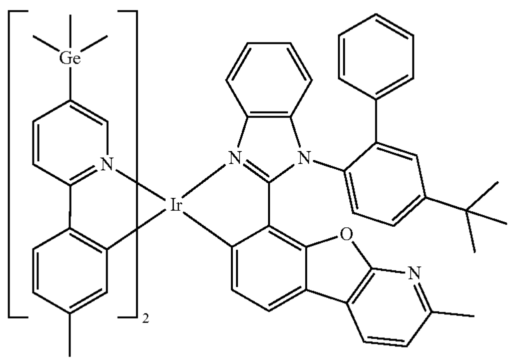
1783
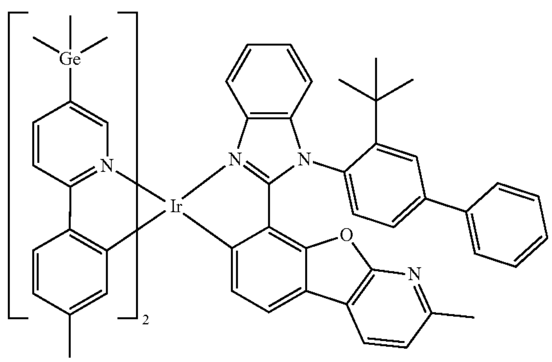
1784
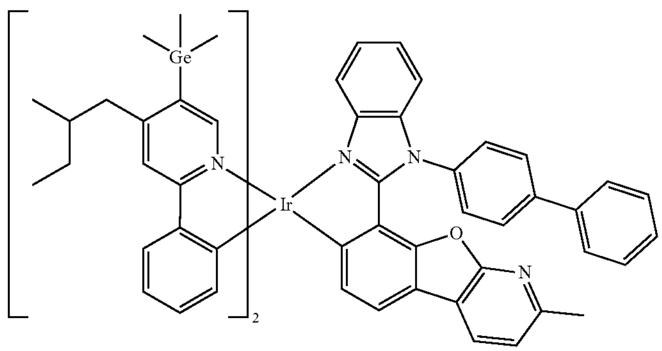
1785
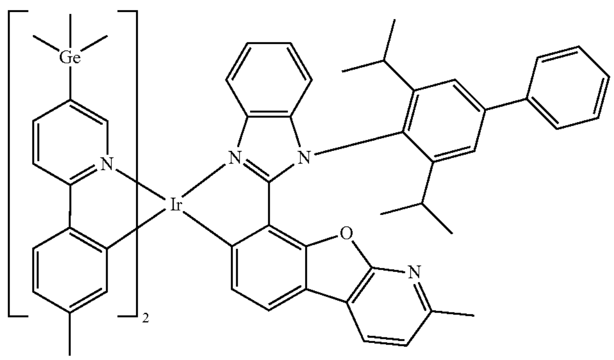

-continued
1786
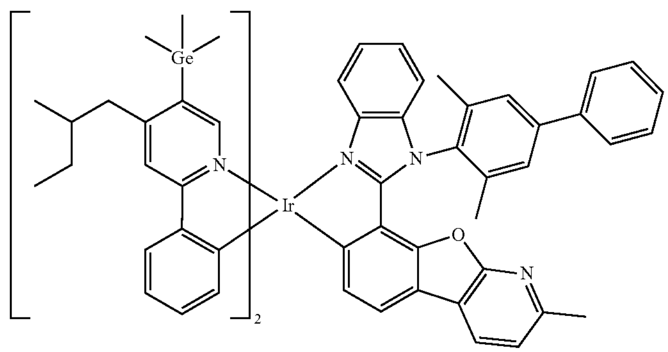
1787
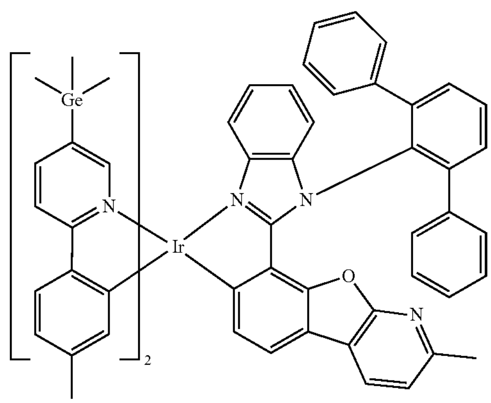
1788
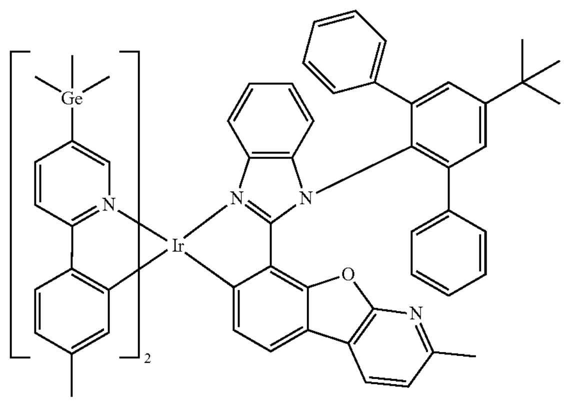
1789
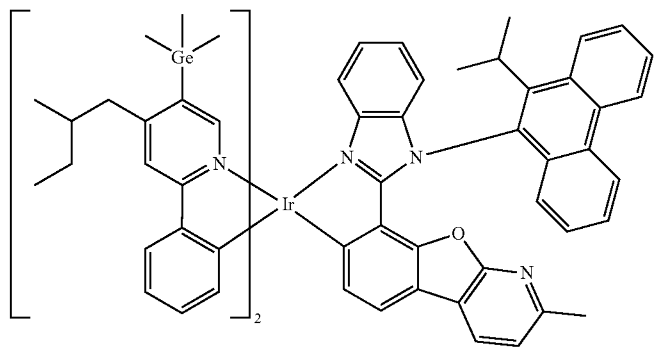

-continued
1790
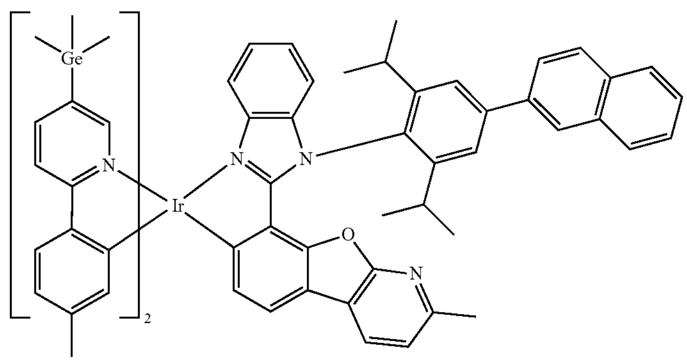
1791
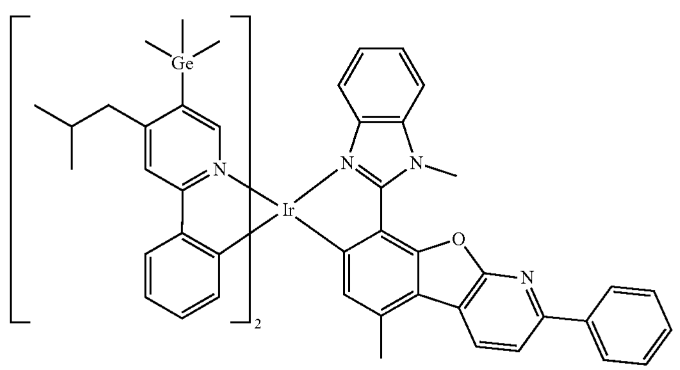
1792
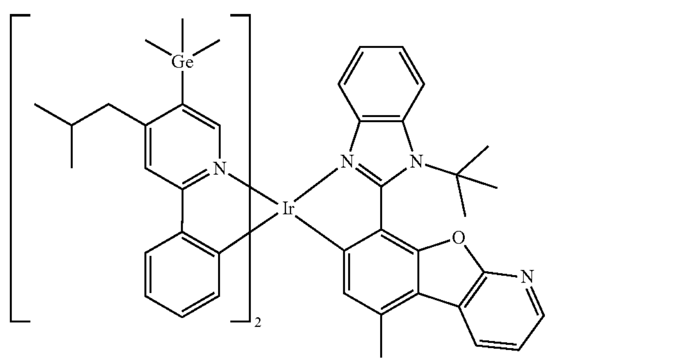
1793
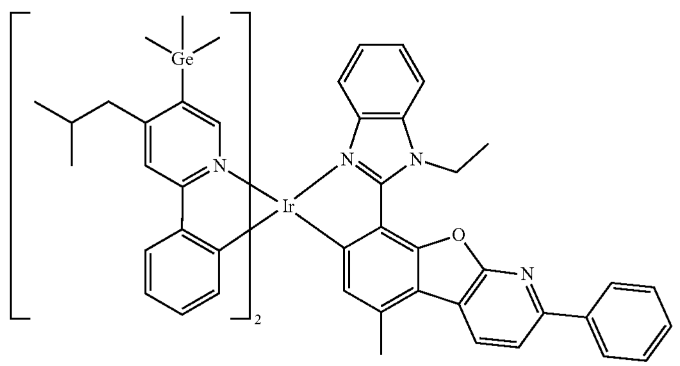

-continued
1794
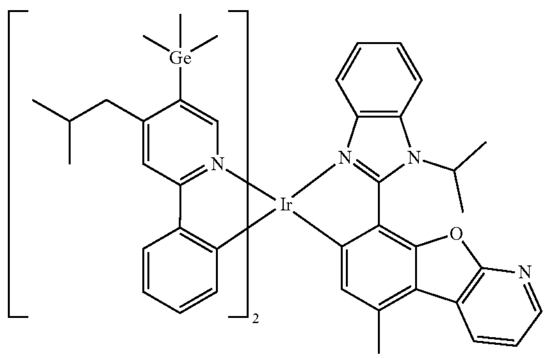
1795
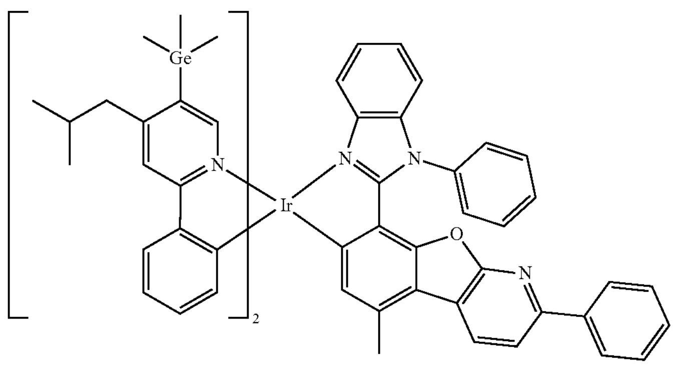
1796
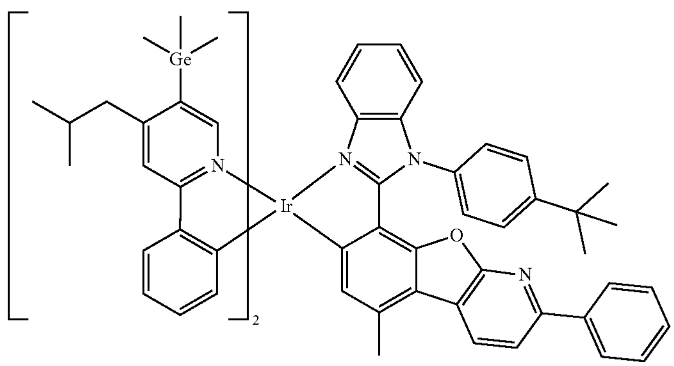
1797
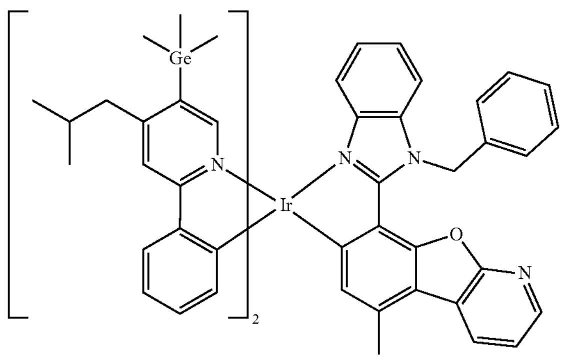

-continued
1798
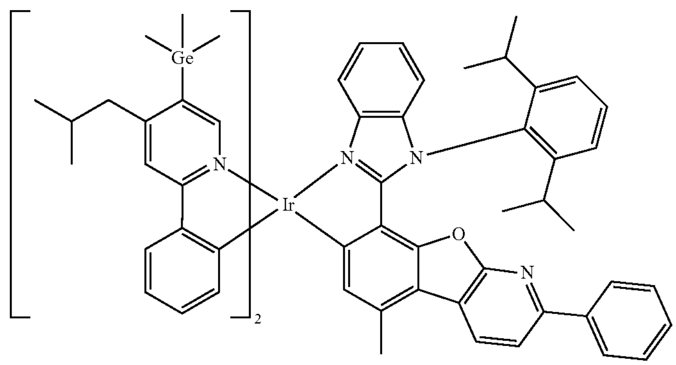
1799
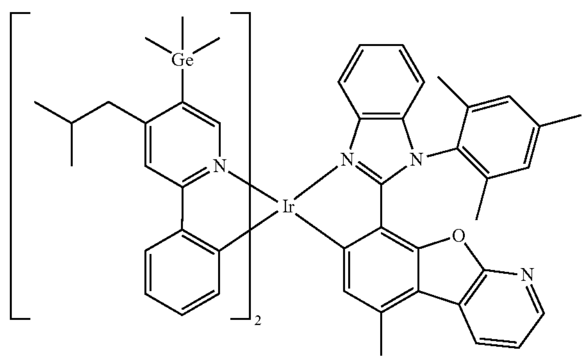
1800
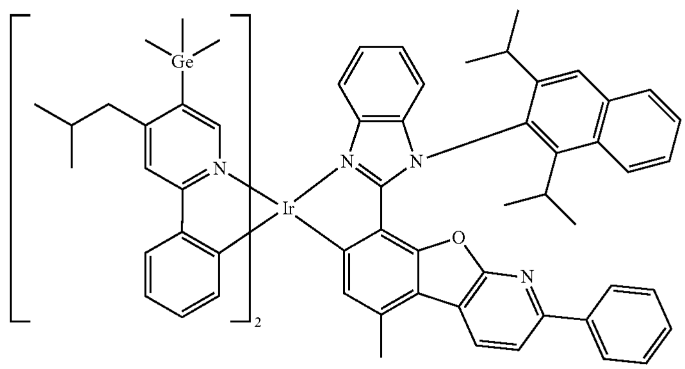
1801
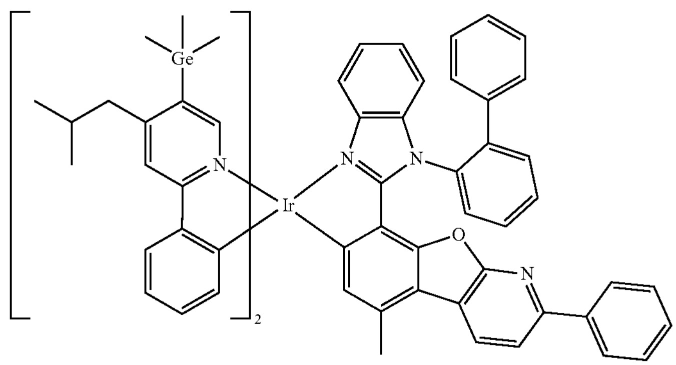

-continued
1802
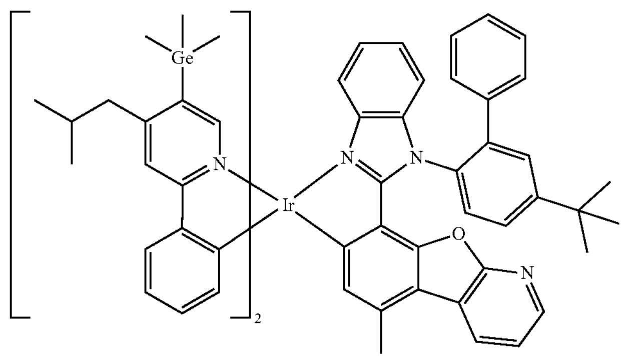
1803
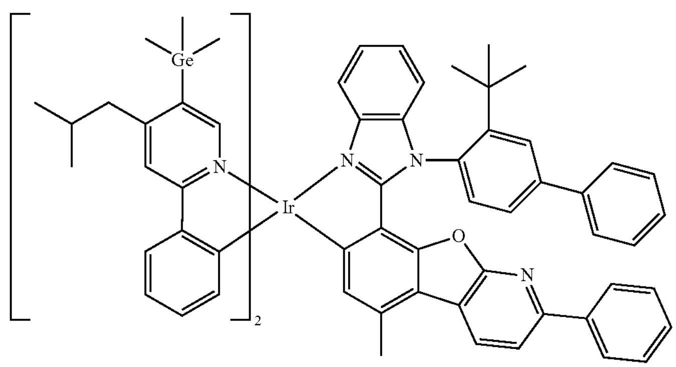
1804
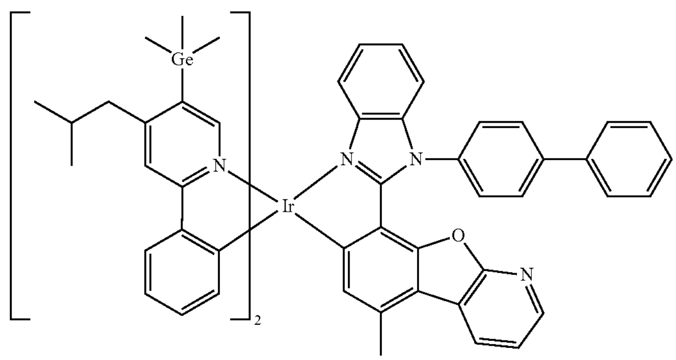
1805
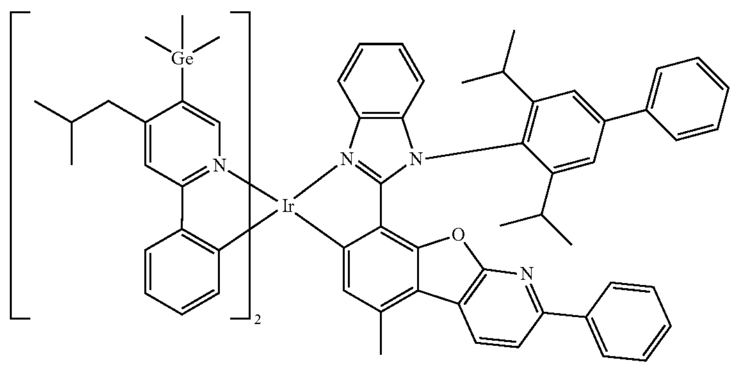

-continued
1806
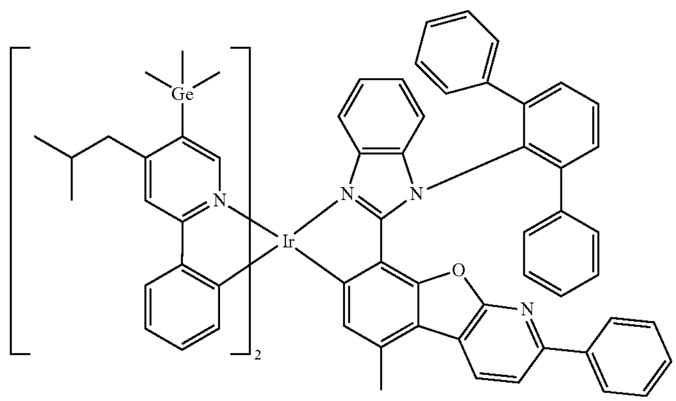
1807
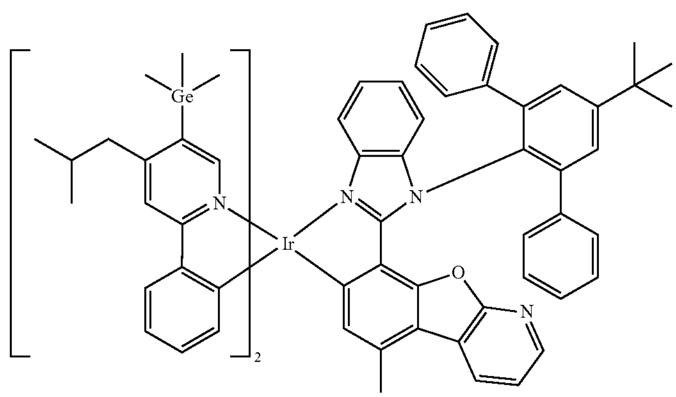
1808
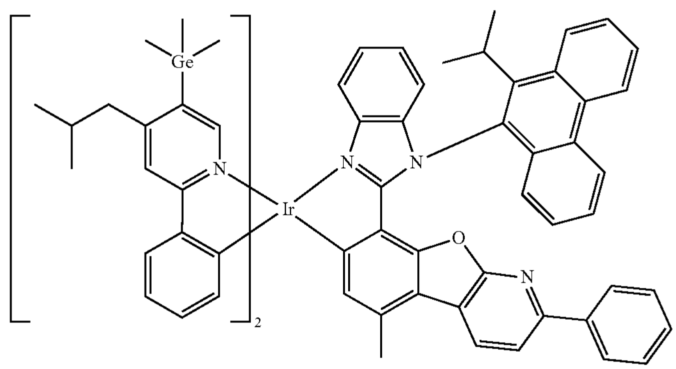
1809
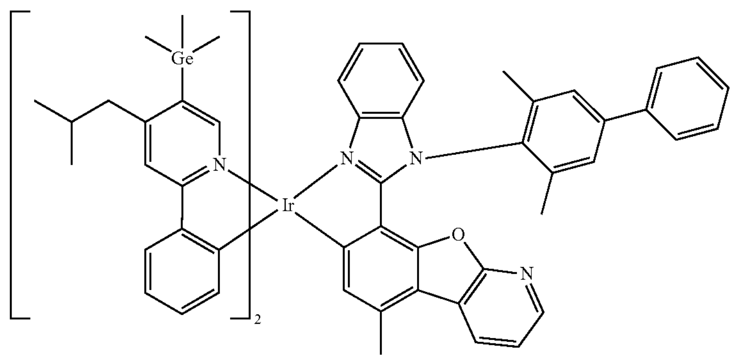

-continued
1810
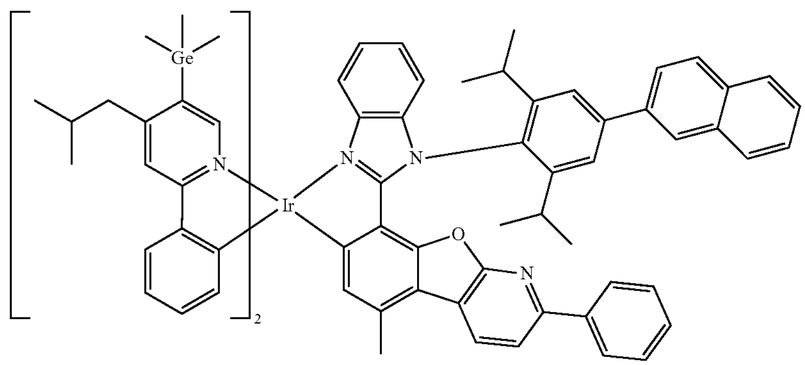
1811
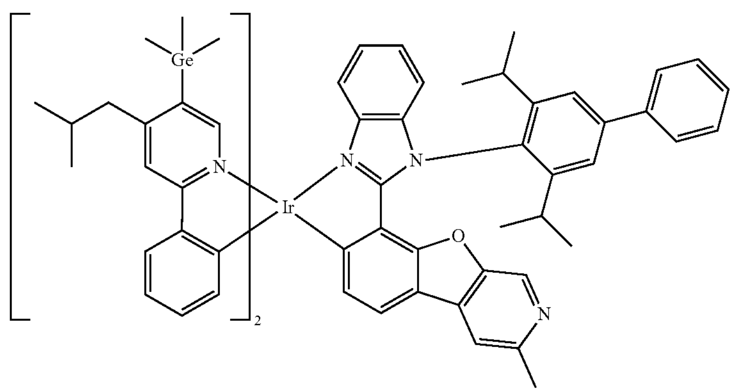
1812
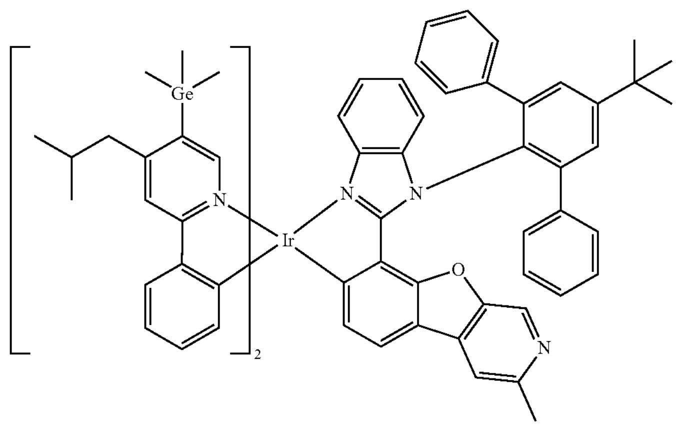
1813
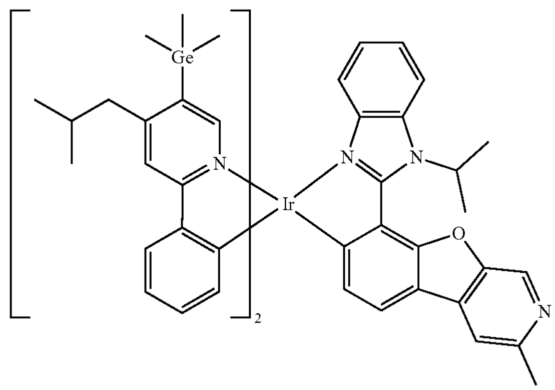

-continued
1814
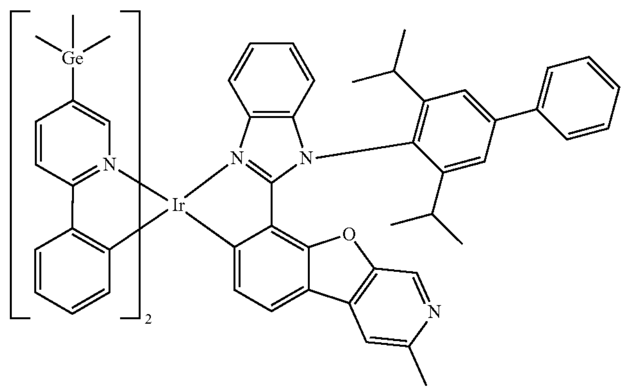
1815
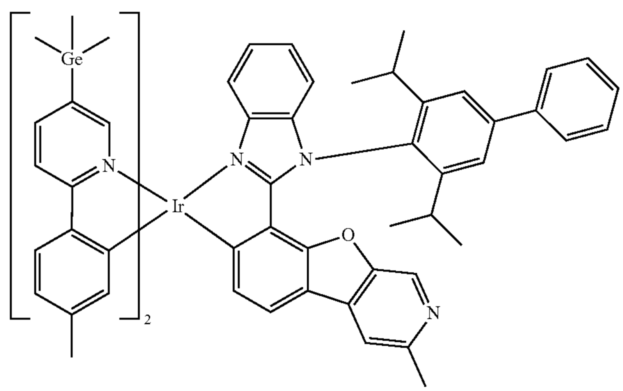
1816
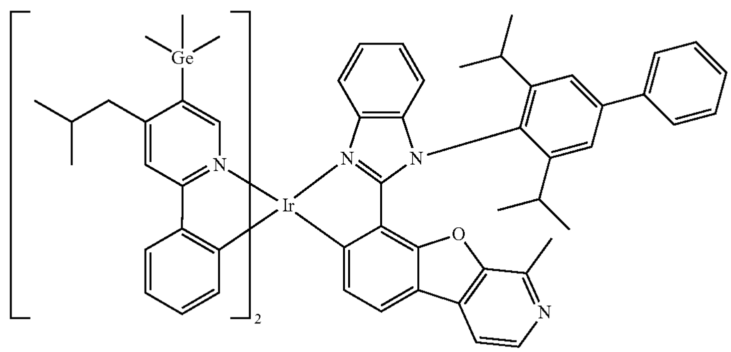
1817
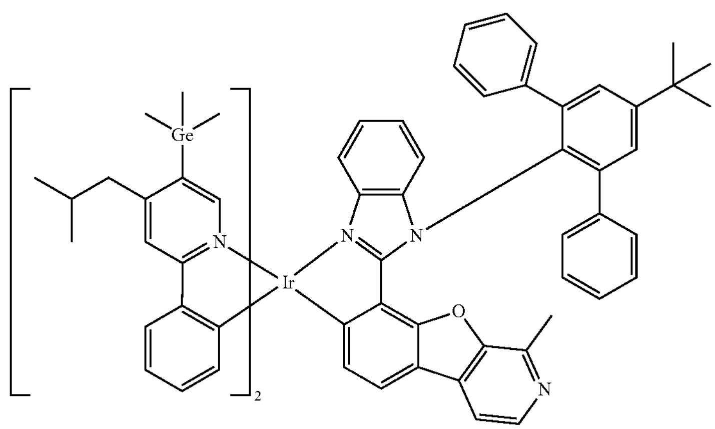

-continued
1818
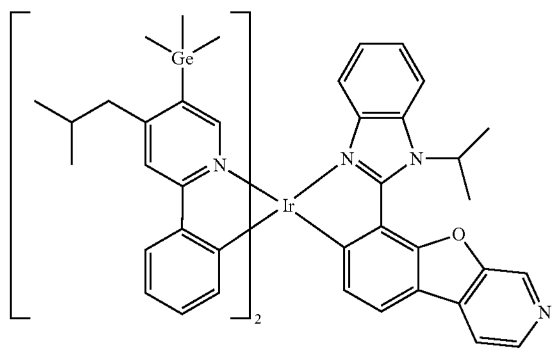
1819
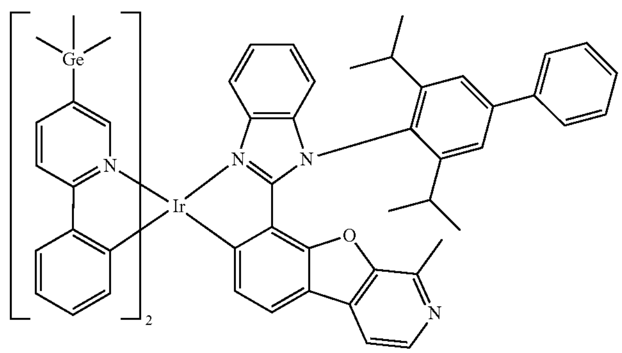
1820
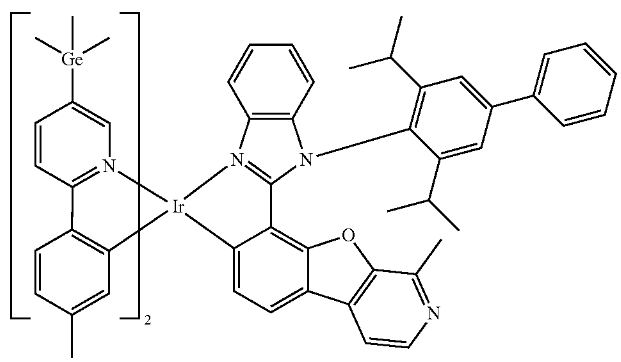
1821
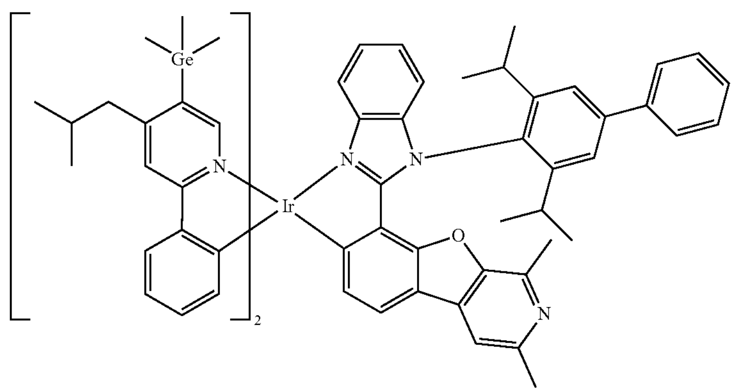

-continued
1822
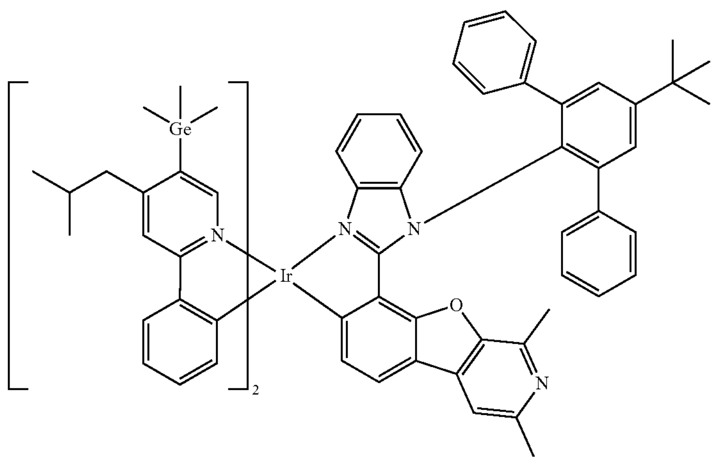
1823
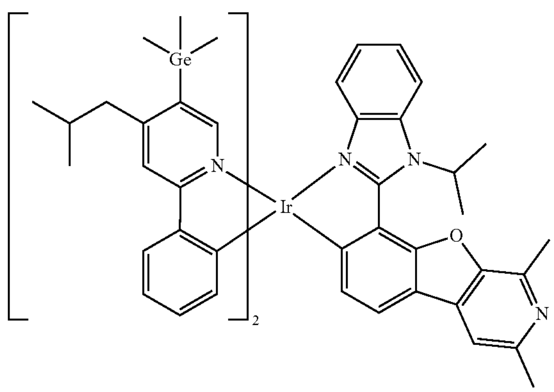
1824
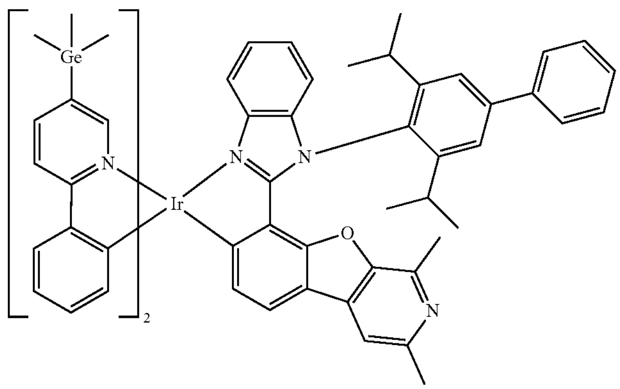
1825
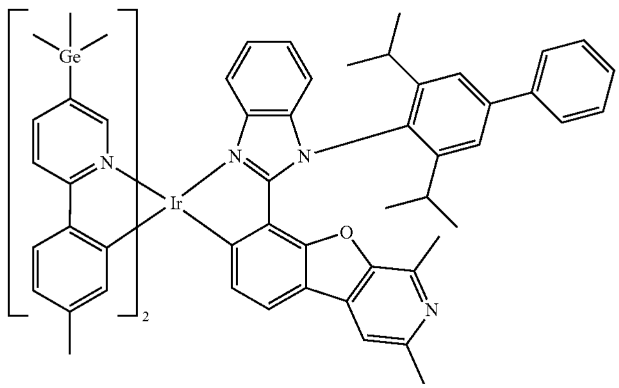

-continued
1826
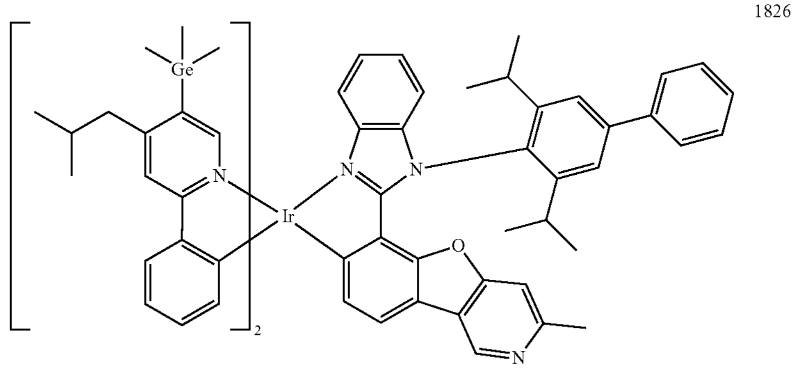
1827
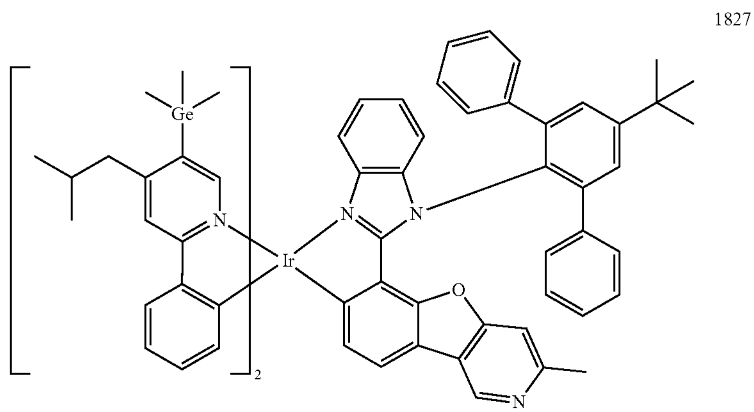
1828
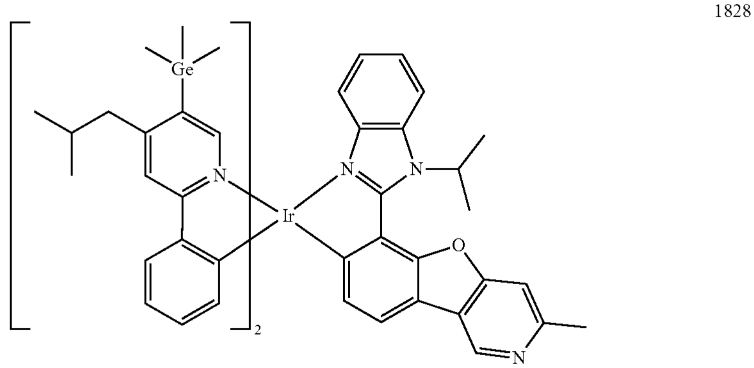
1829
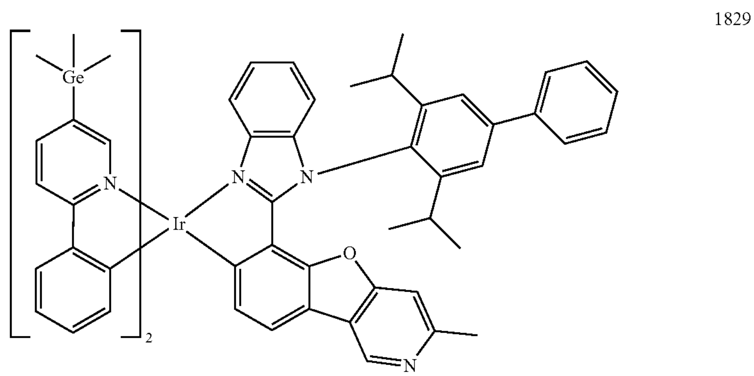

-continued
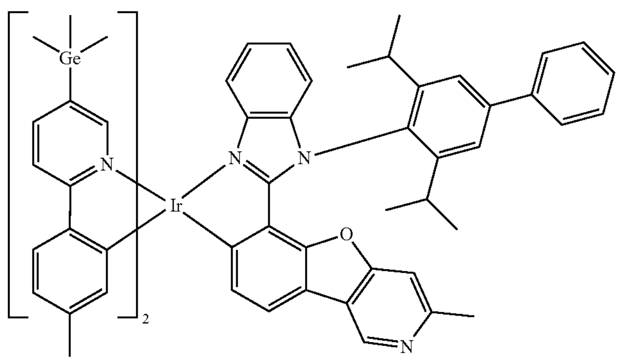
1831
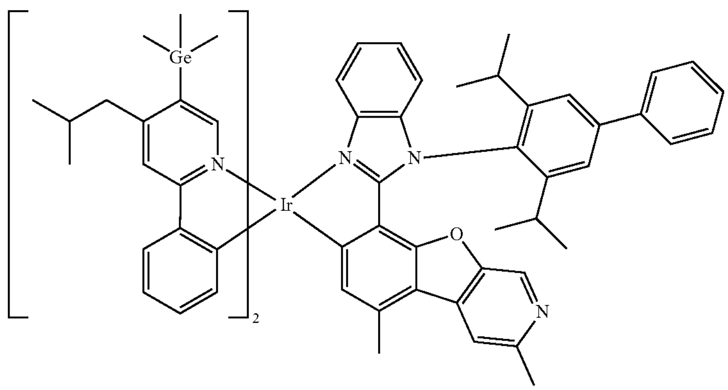
1832
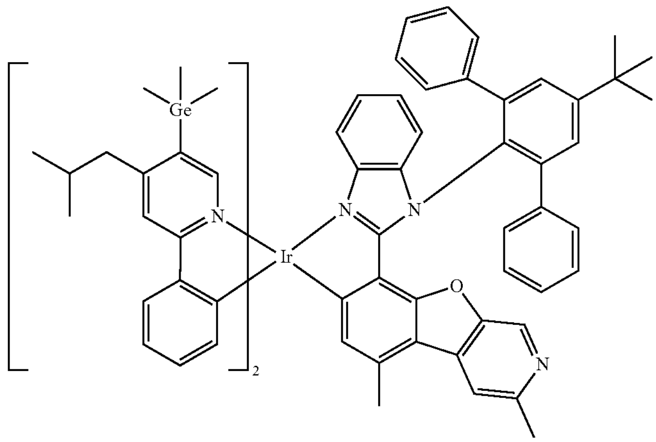
1833
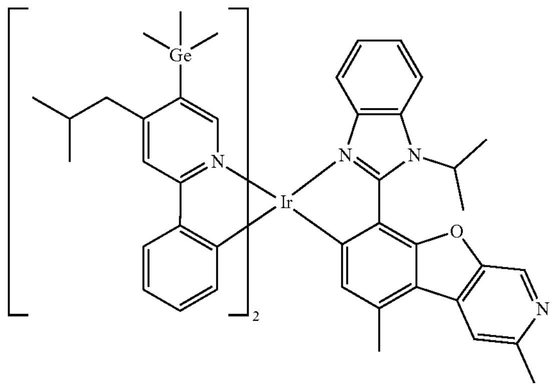

-continued
1834
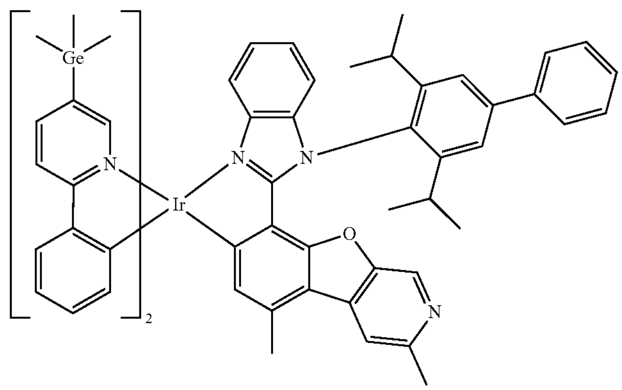
1835
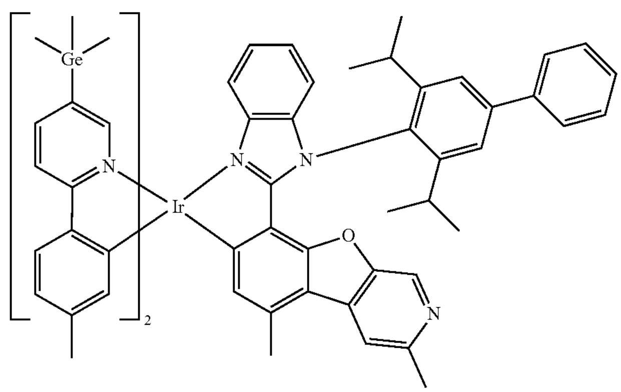
1836
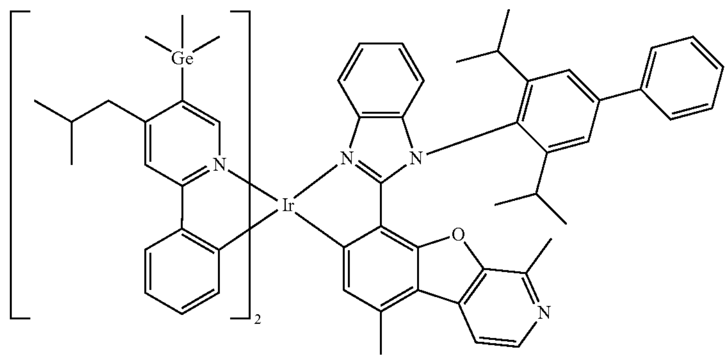
1837
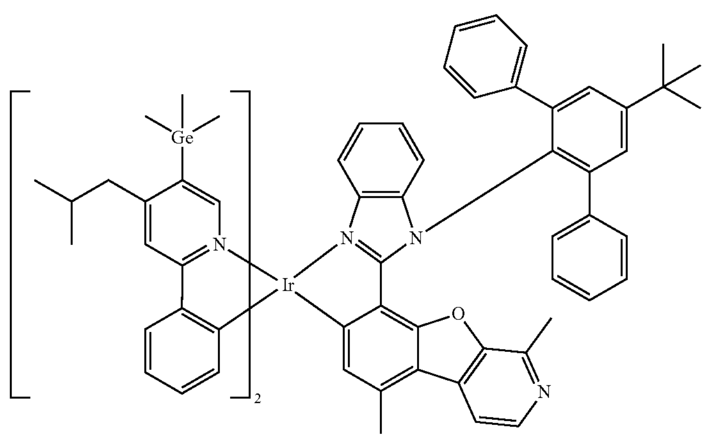

-continued
1838
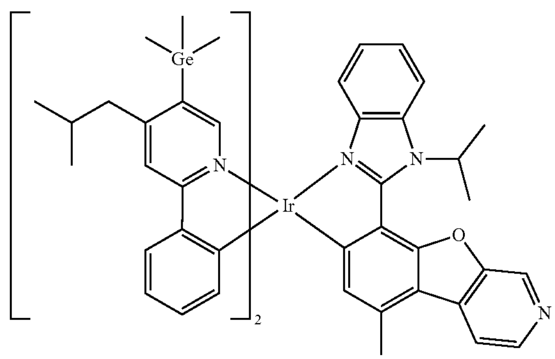
1839
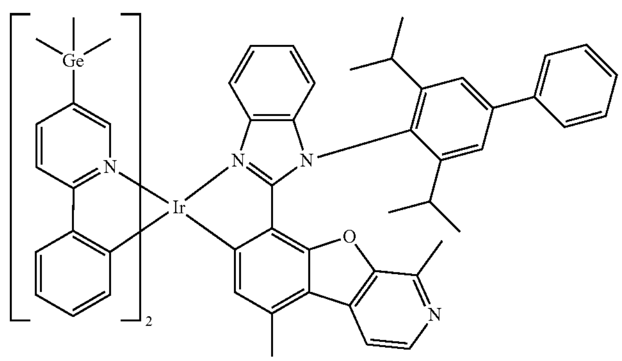
1840
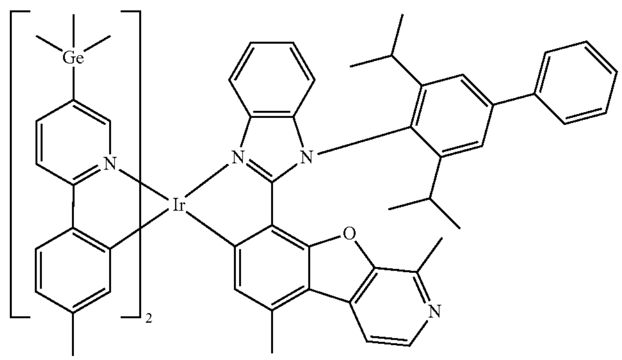
1841
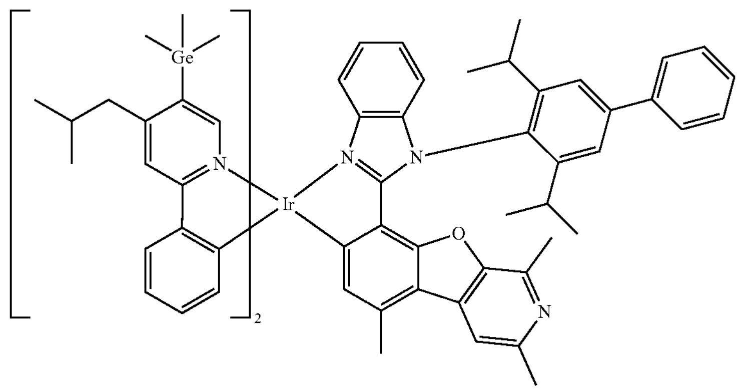

-continued
1842
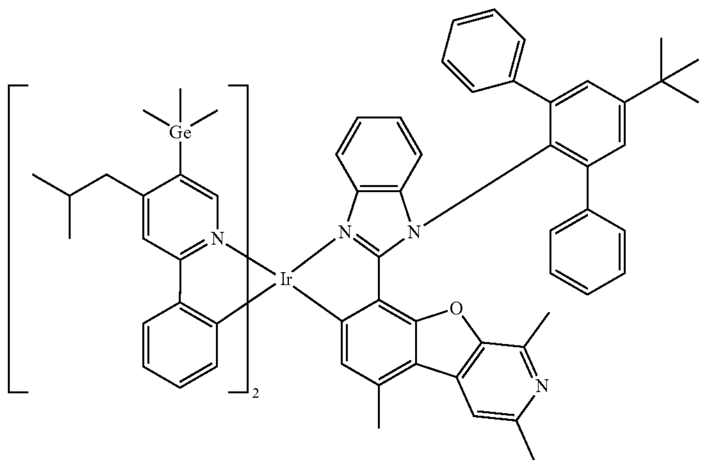
1843
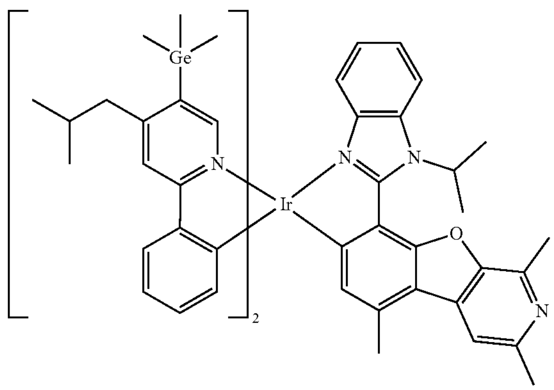
1844
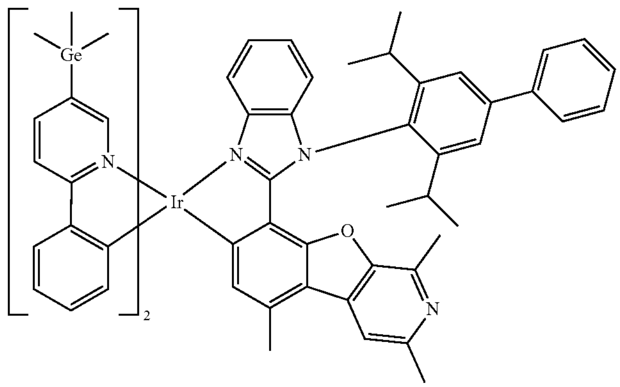
1845
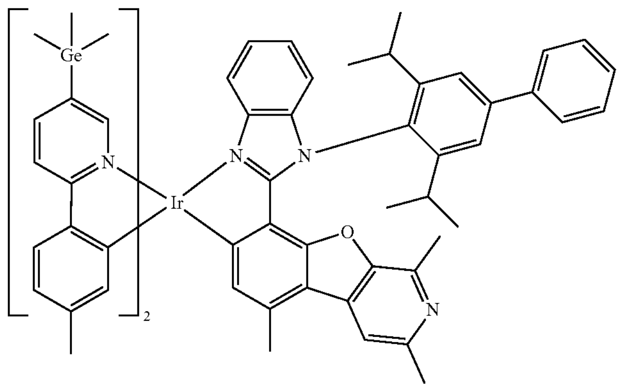

-continued
1846
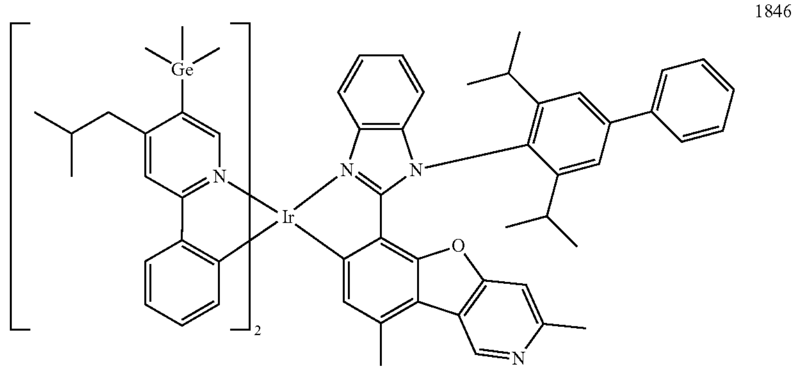
1847
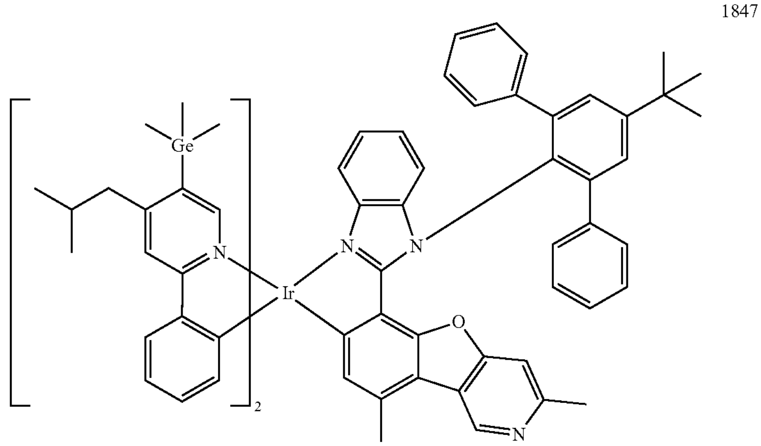
1848
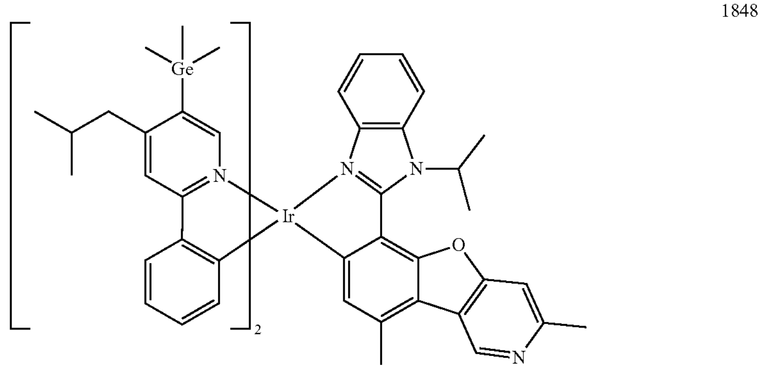
1849
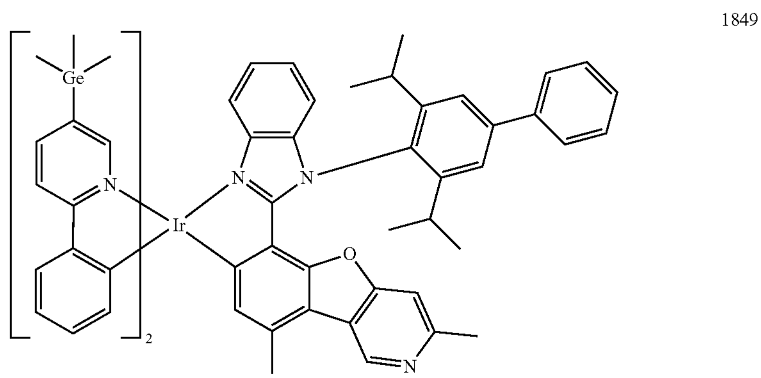

-continued
1850
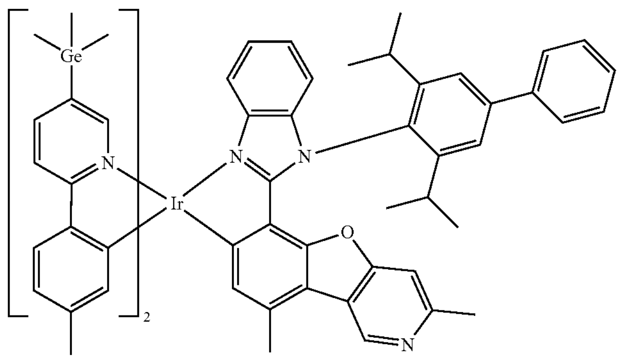
1851
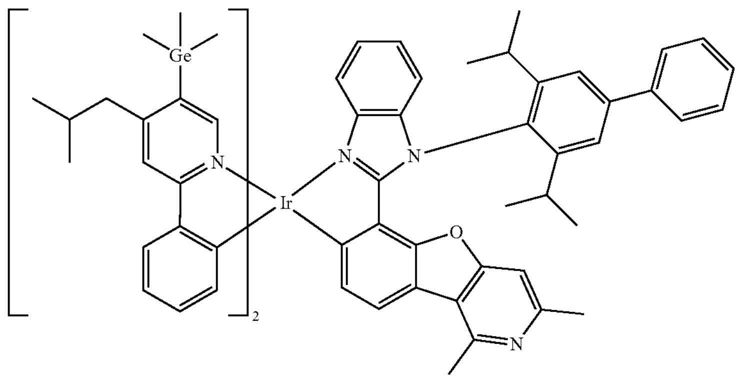
1852
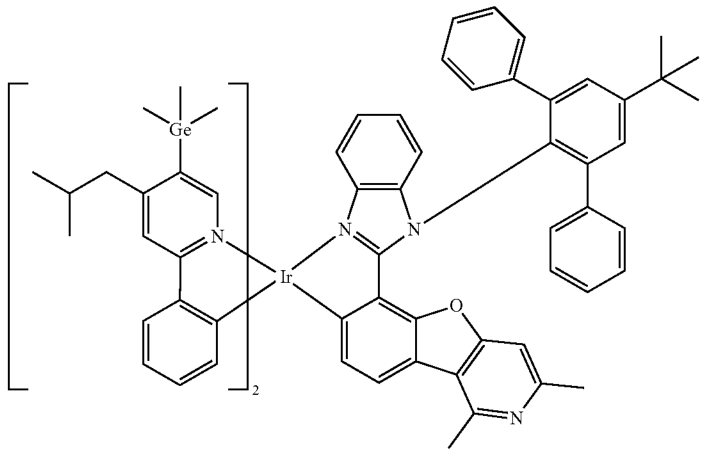
1853
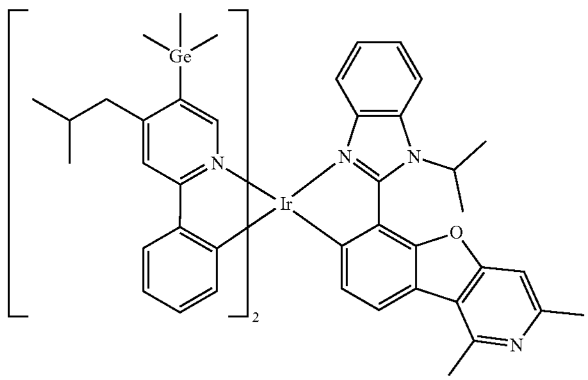

-continued
1854
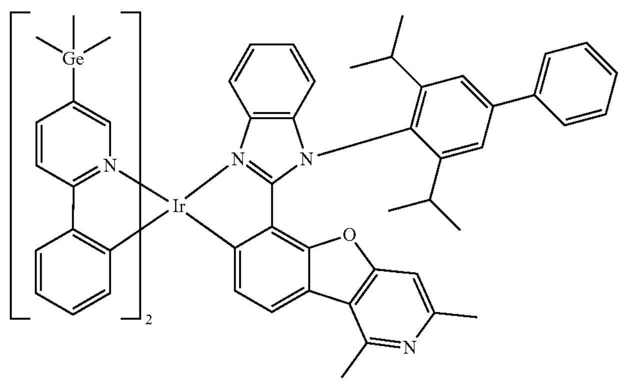
1855
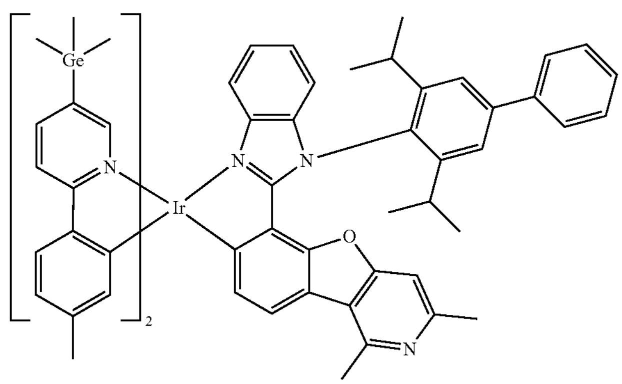
1856
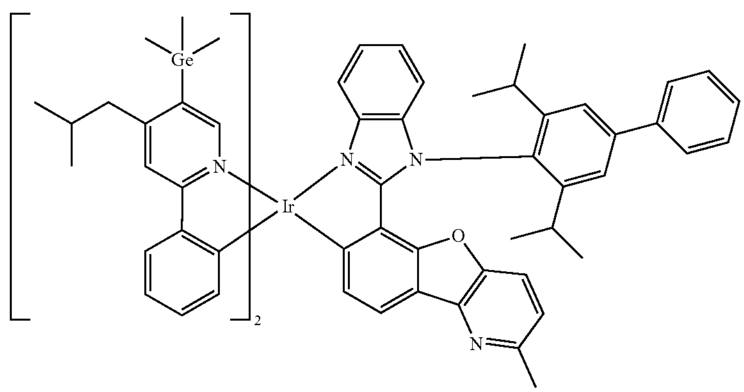
1857
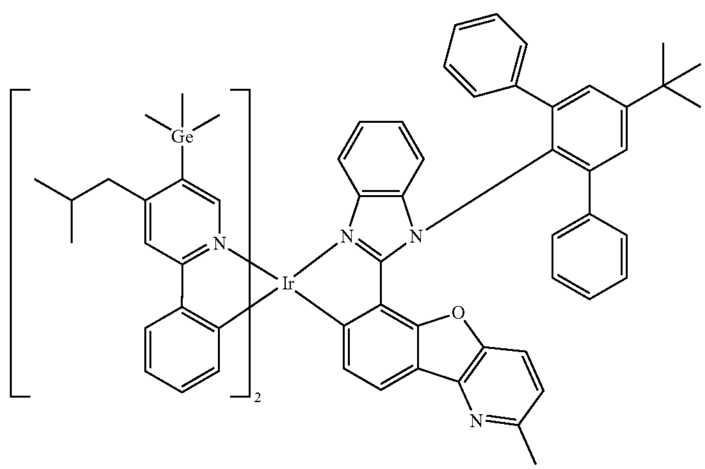

-continued
1858
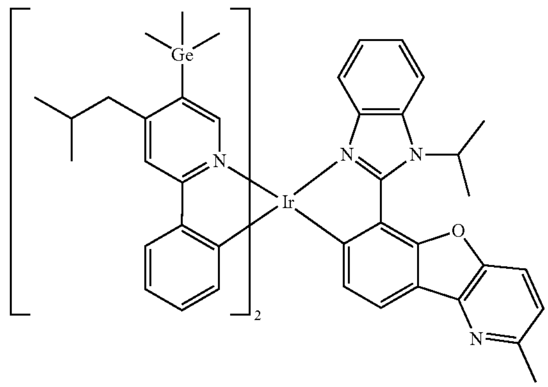
1859
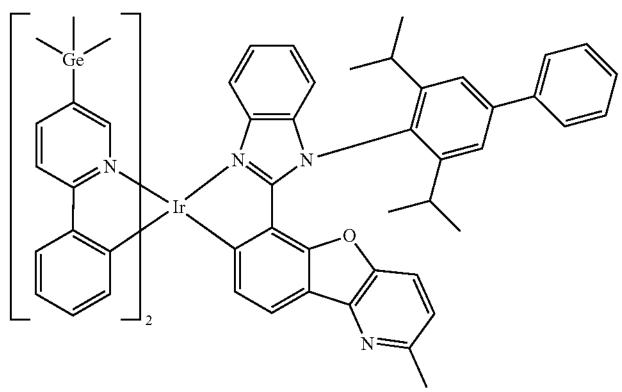
1860
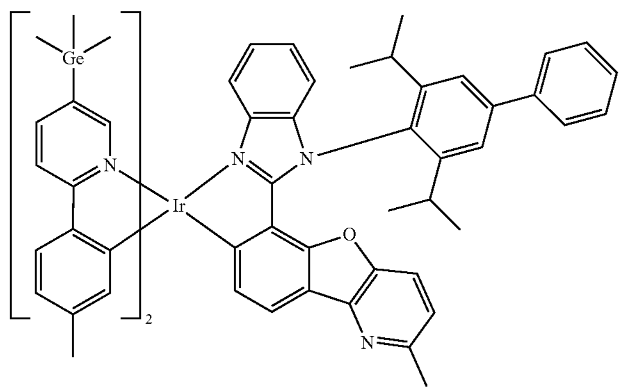
1861
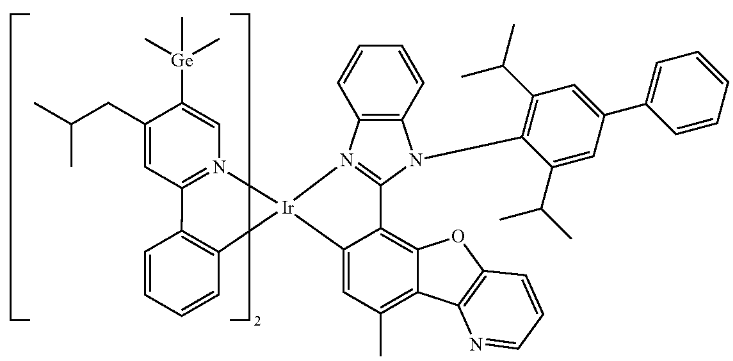

-continued
1862
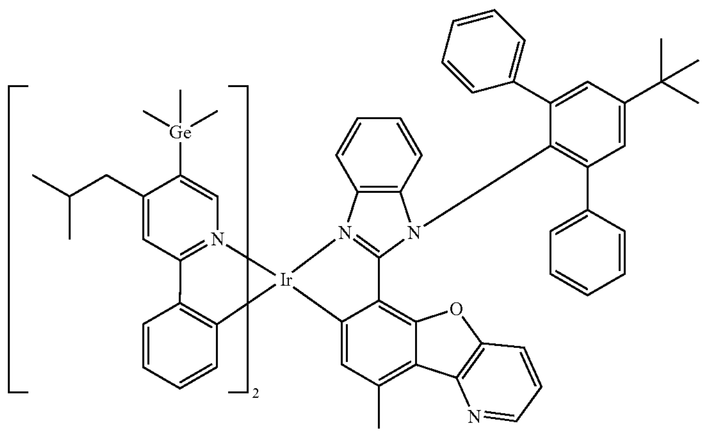
1863
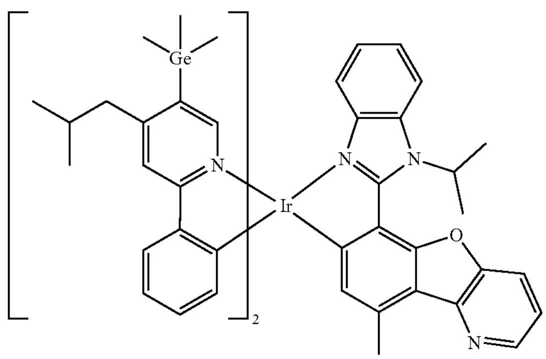
1864
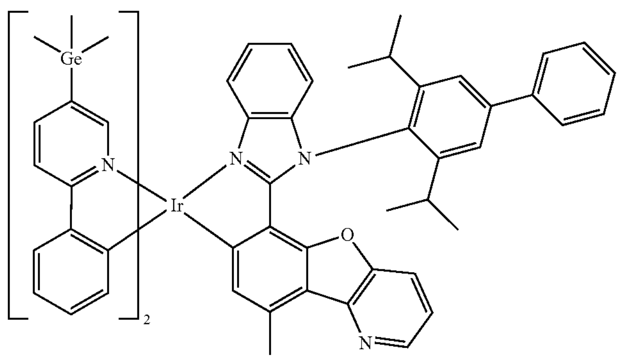
1865
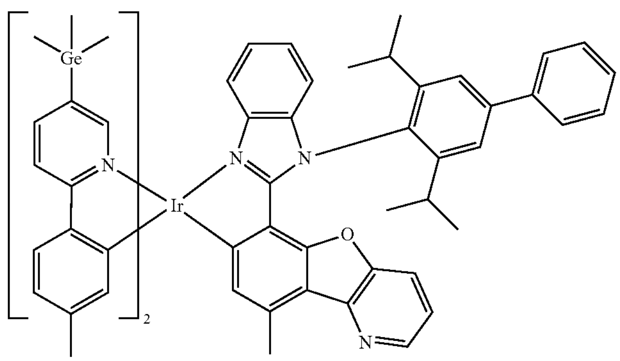

-continued
1866
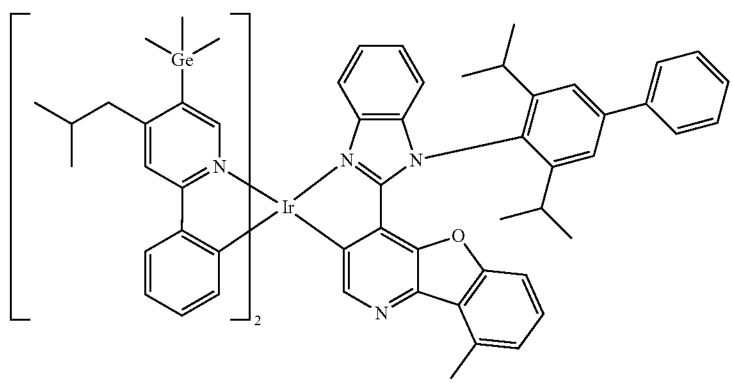
1867
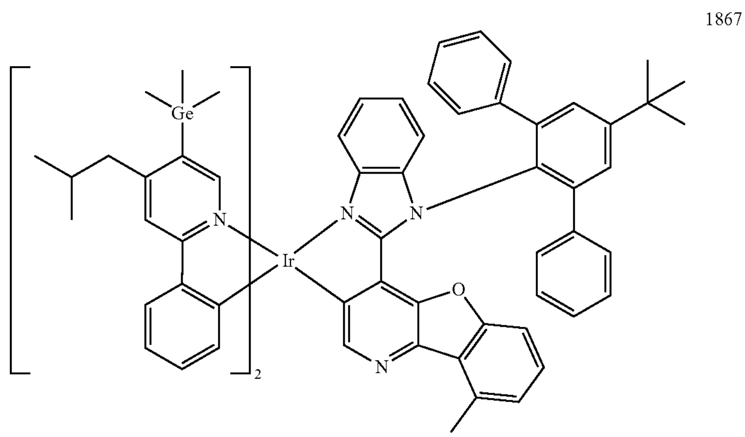
1868
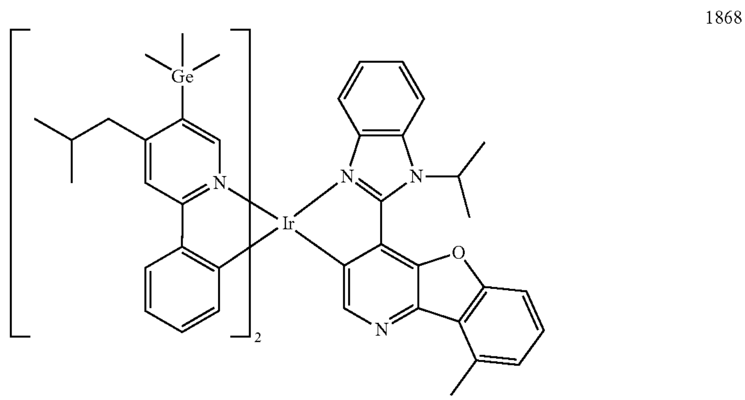
1869
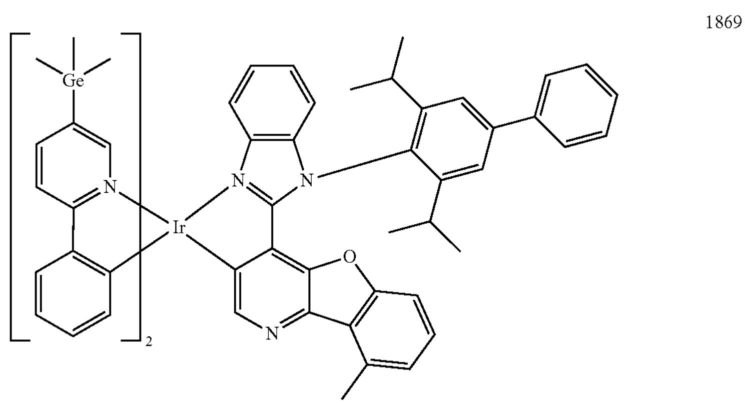

-continued
1870
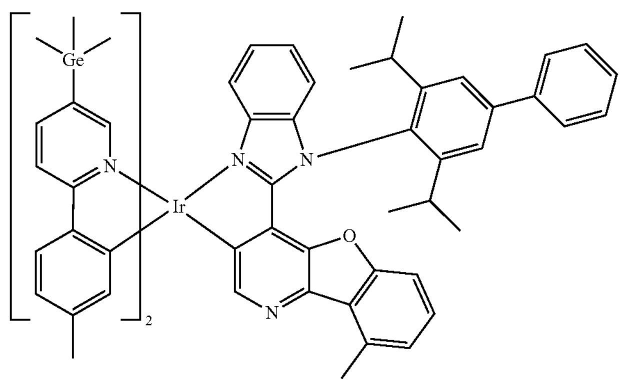
1871
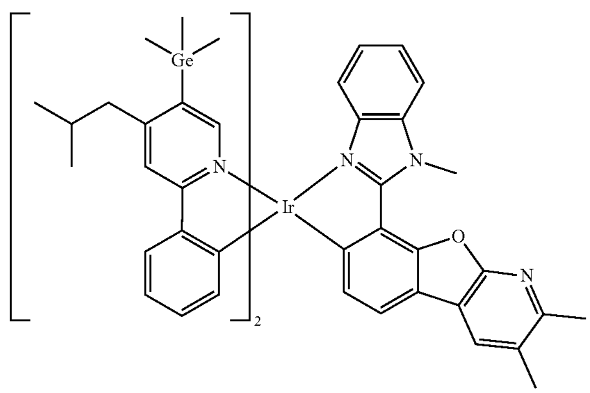
1872
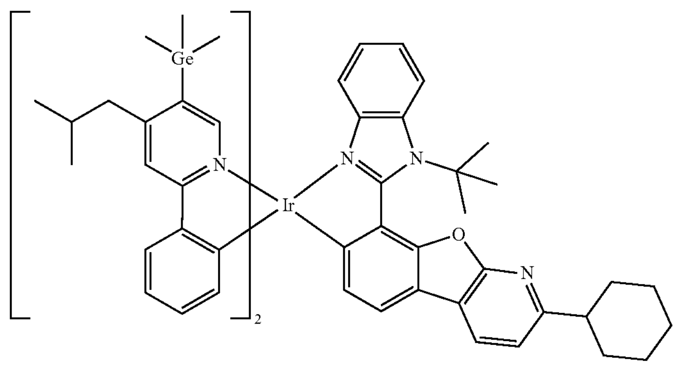
1873
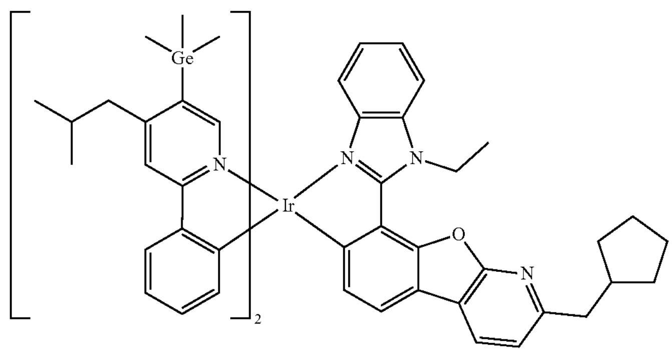

-continued
1874
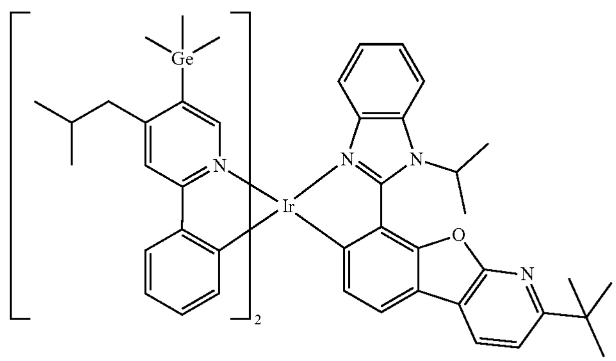
1875
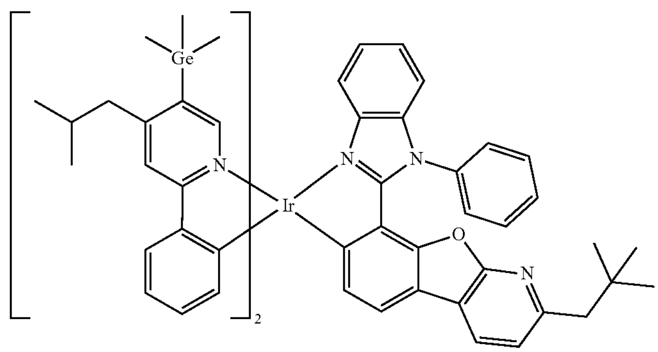
1876
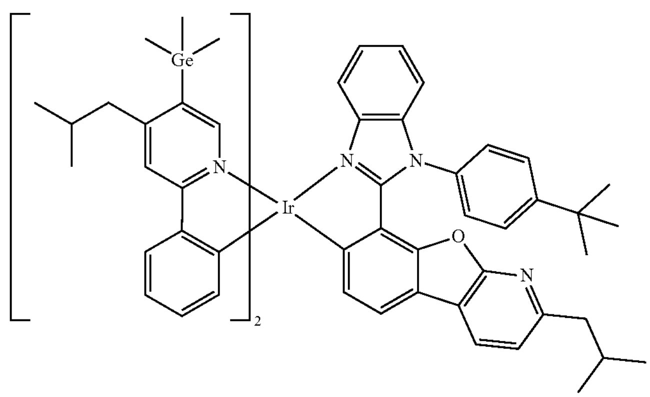
1877
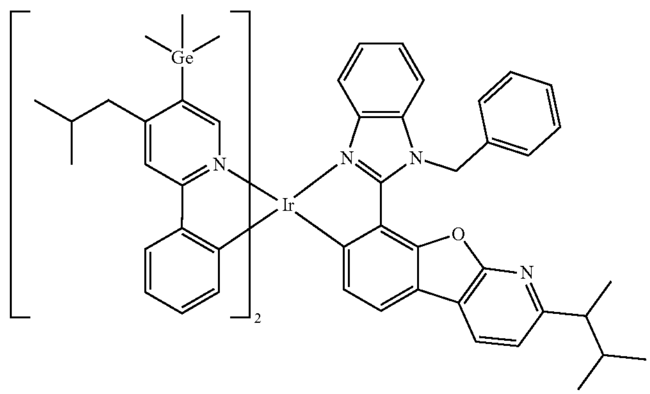

-continued
1878
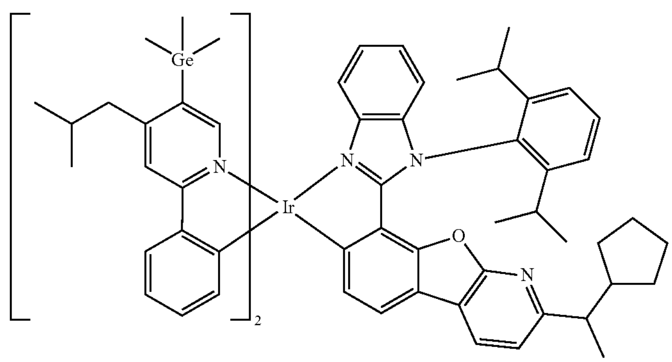
1879
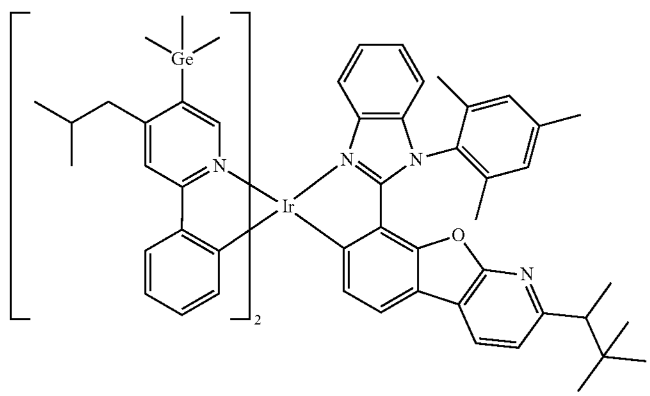
1880
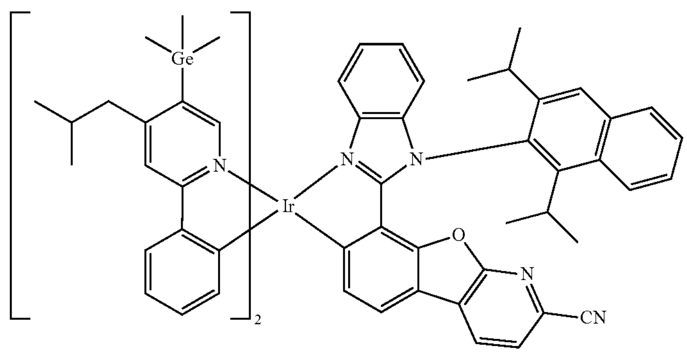
1881
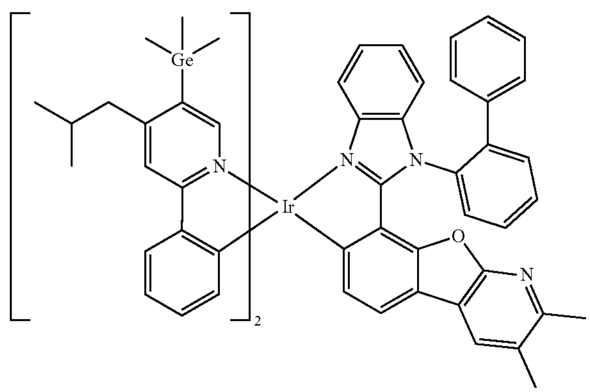

-continued
1882
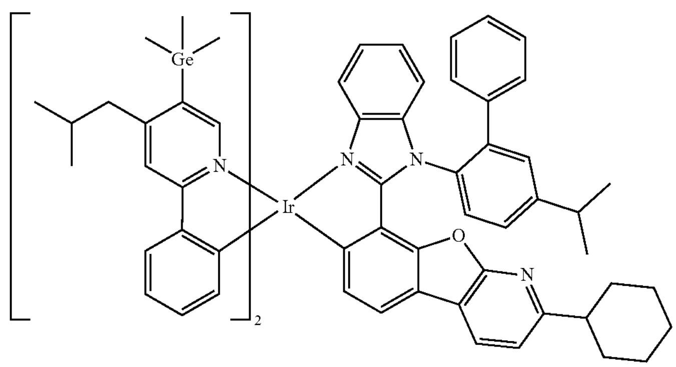
1883
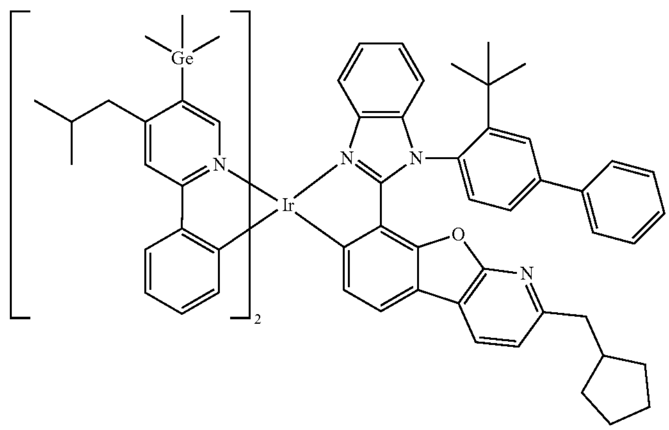
1884
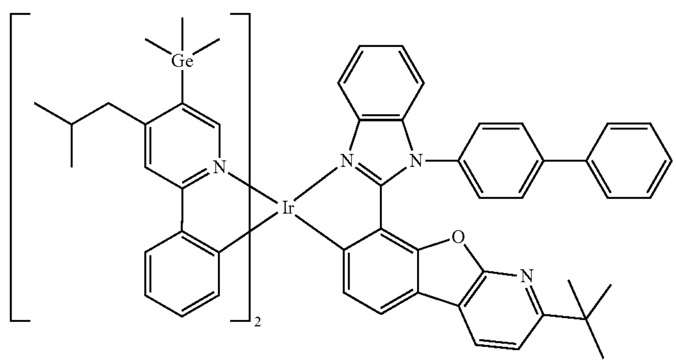
1885
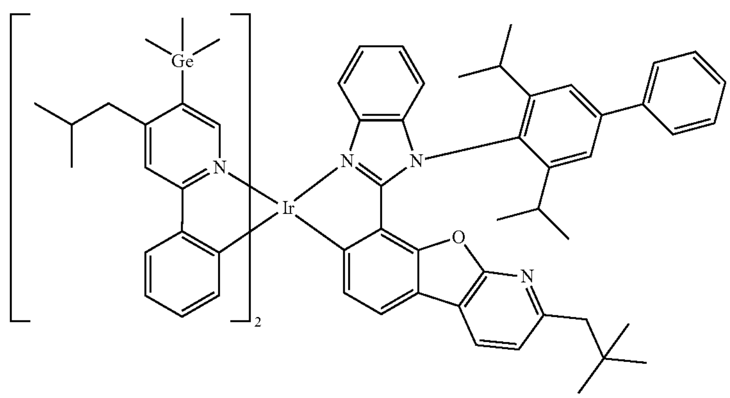

-continued
1886
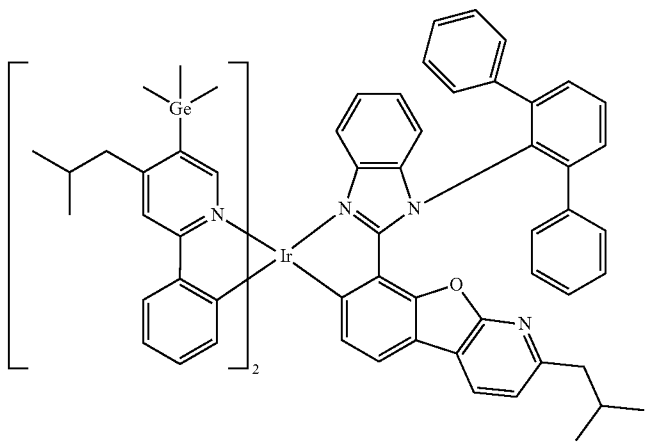
1887
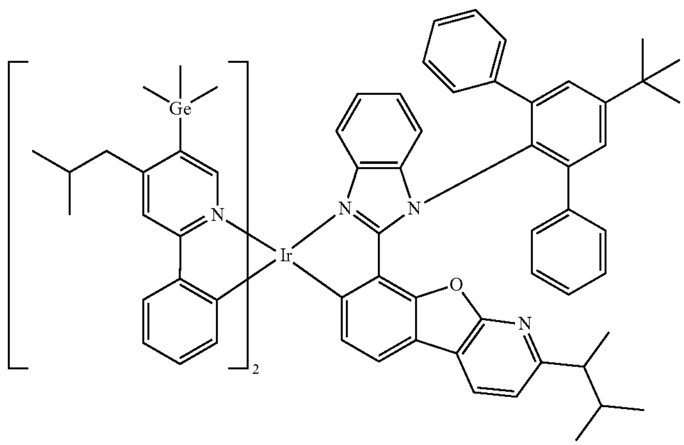
1888
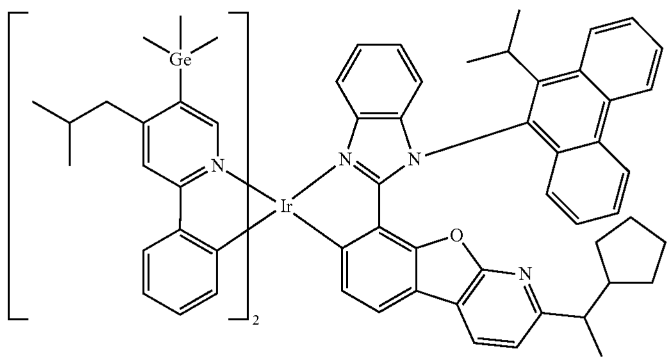
1889
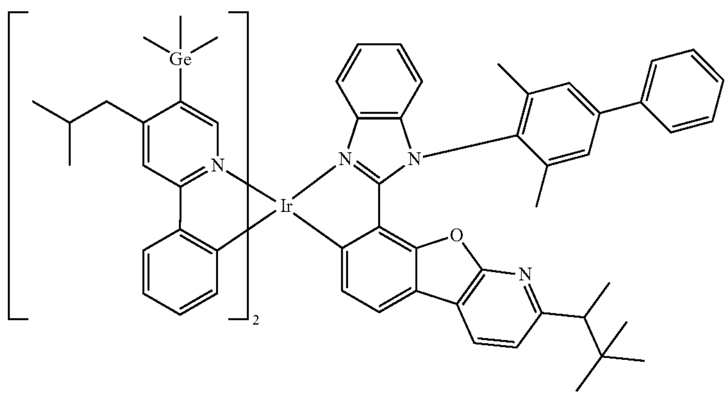

-continued
1890
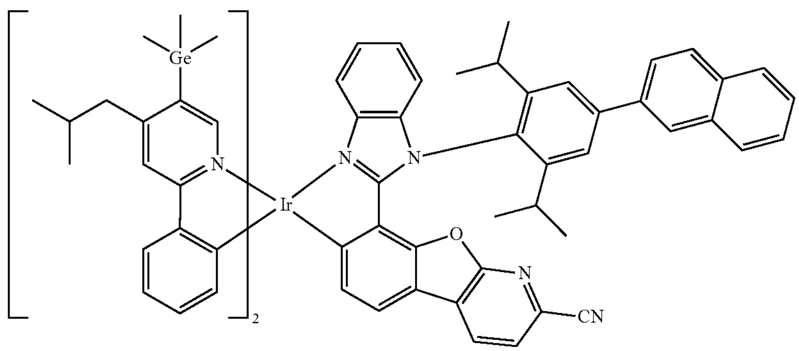
1891
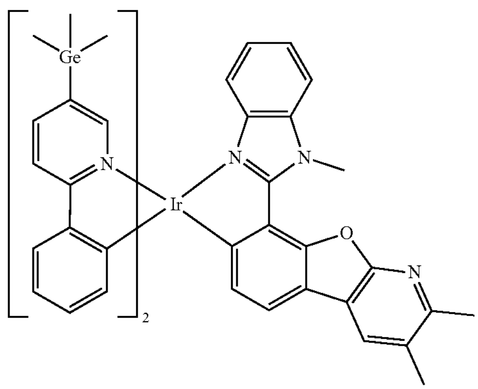
1892
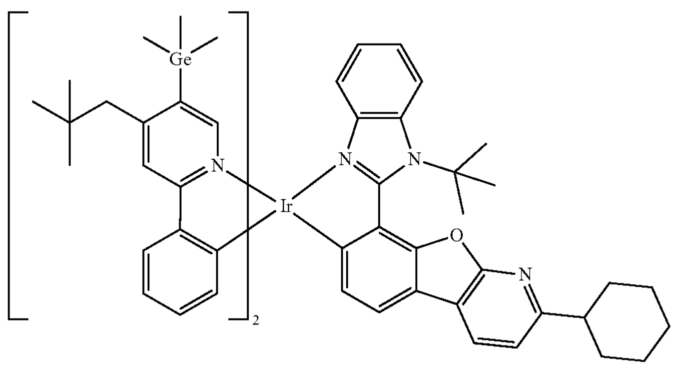
1893
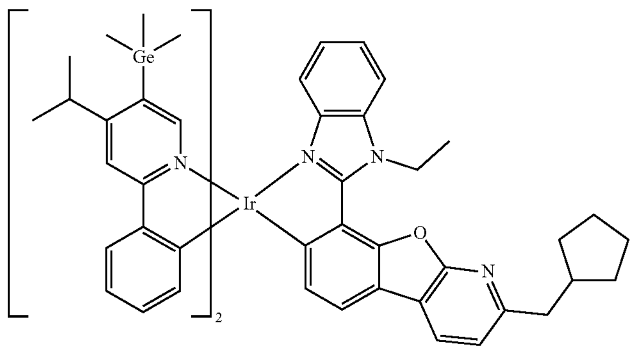

-continued
1894
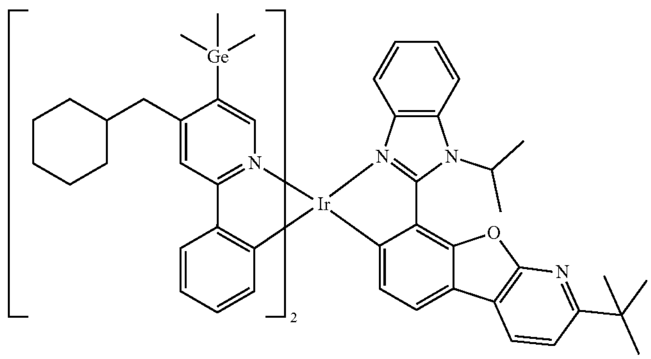
1895
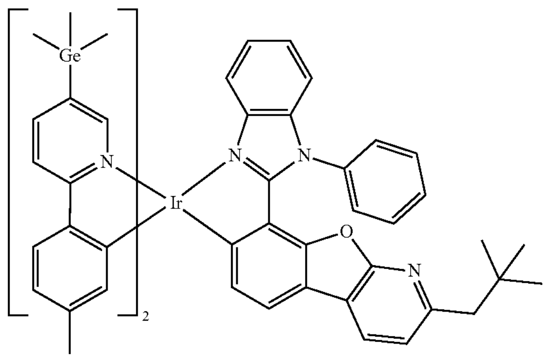
1896
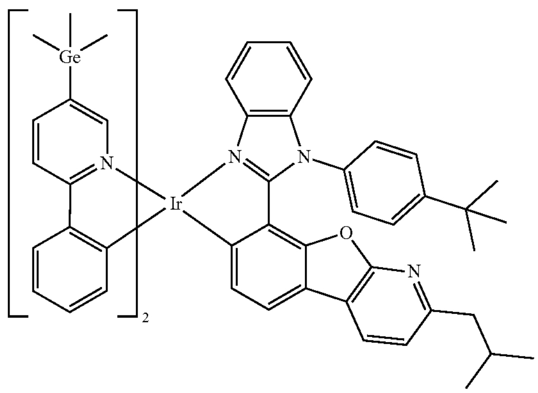
1897
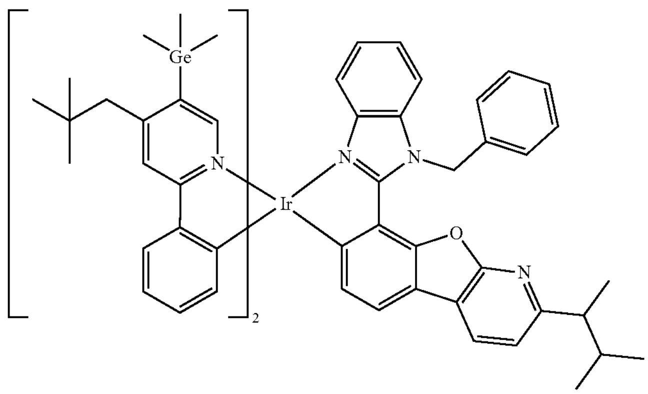

-continued
1898
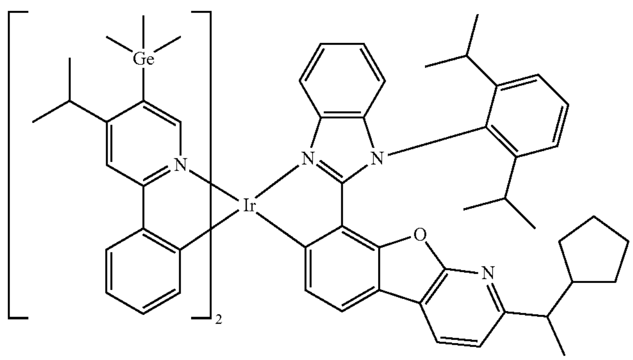
1899
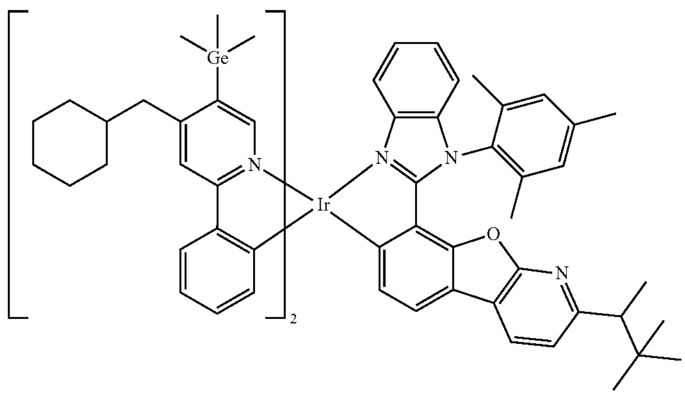
1900
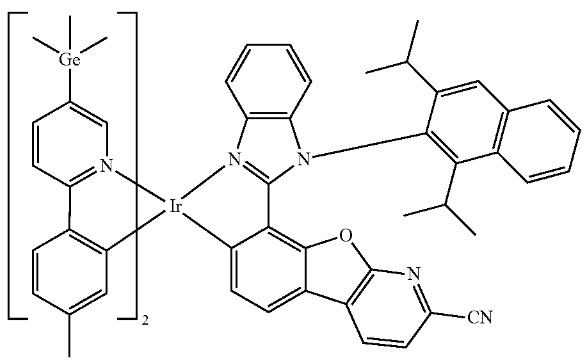
1901
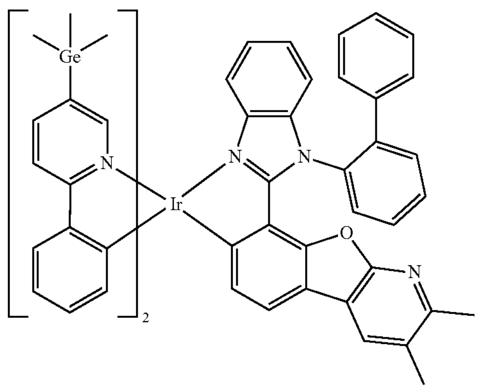

-continued
1902
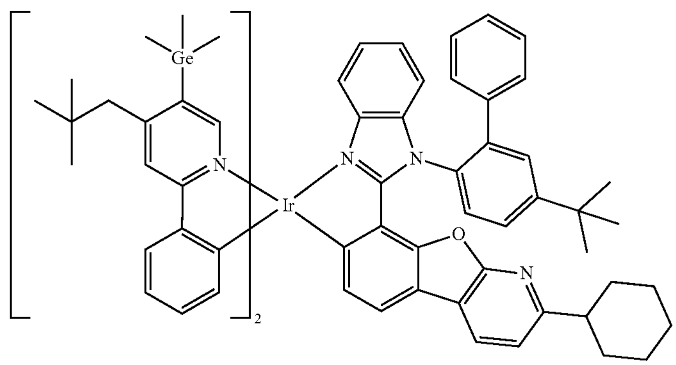
1903
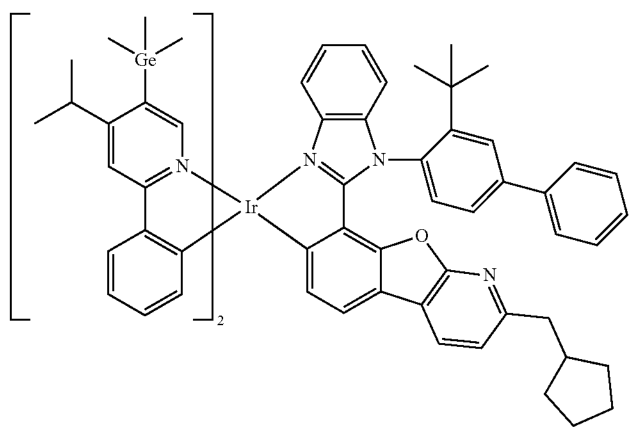
1904
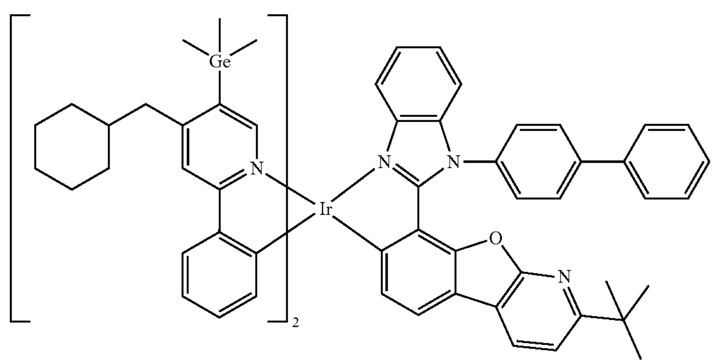
1905
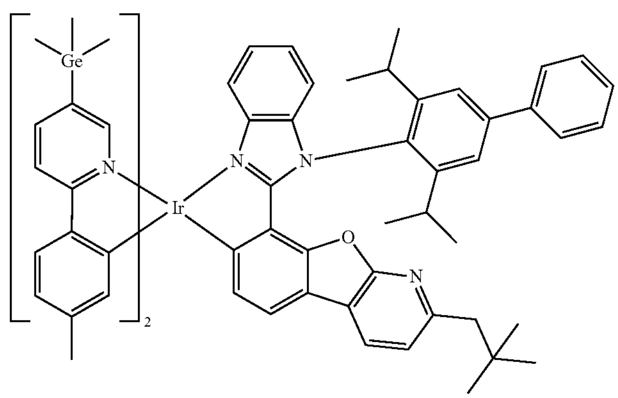

-continued
1906
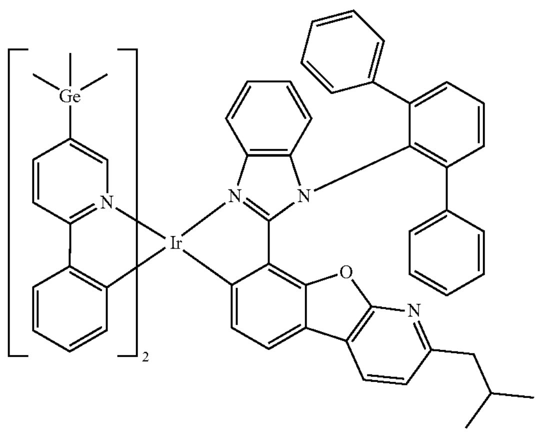
1907
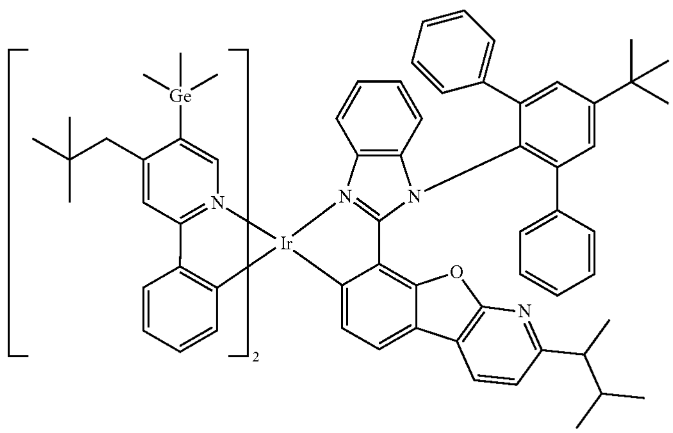
1908
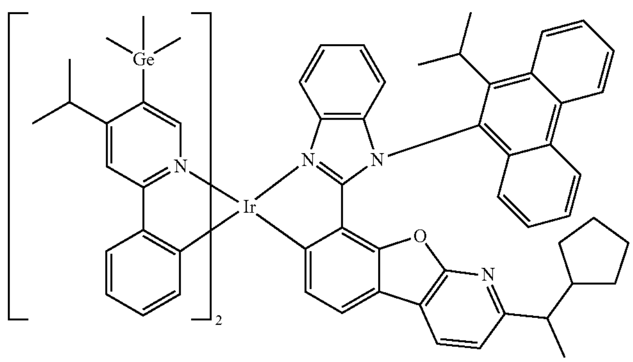
1909
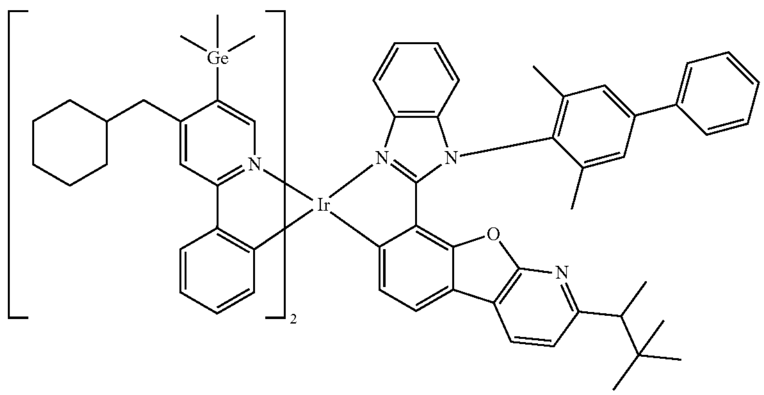

-continued
1910
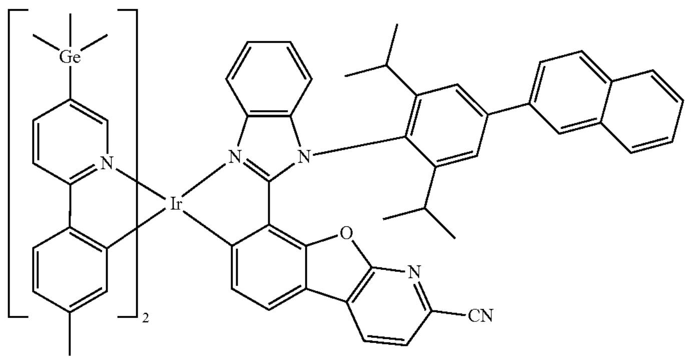
1911
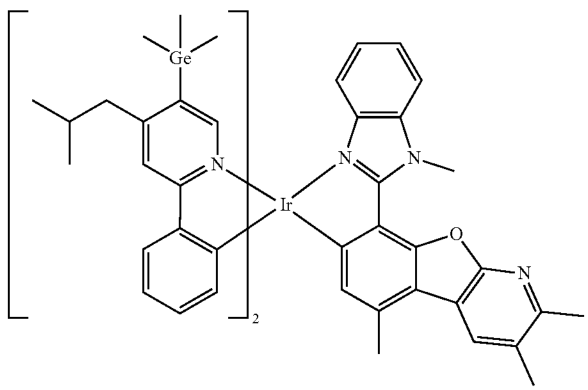
1912
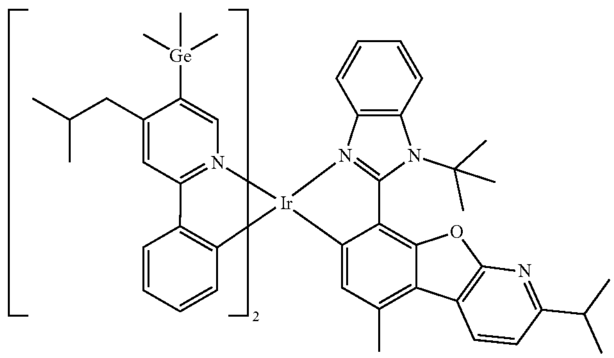
1913
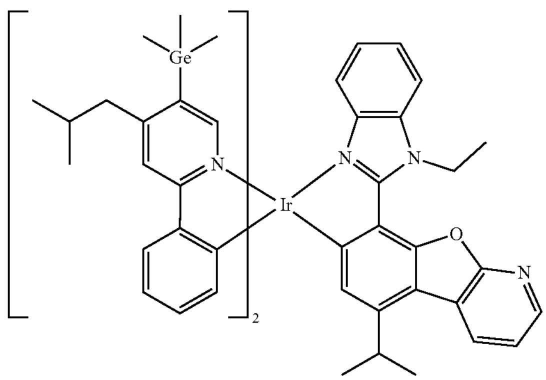

-continued
1914
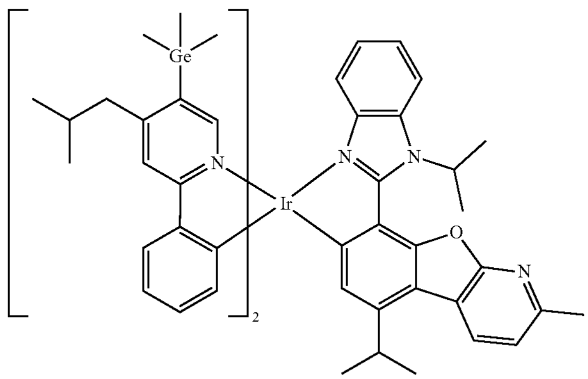
1915
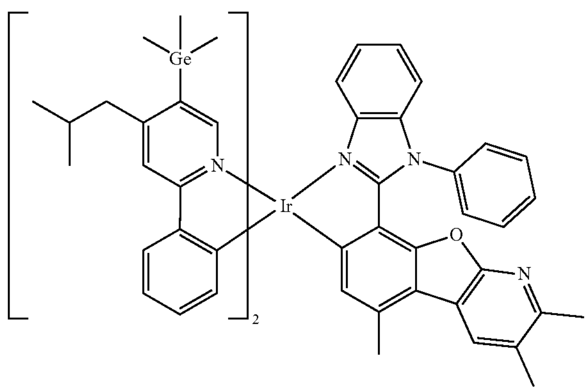
1916
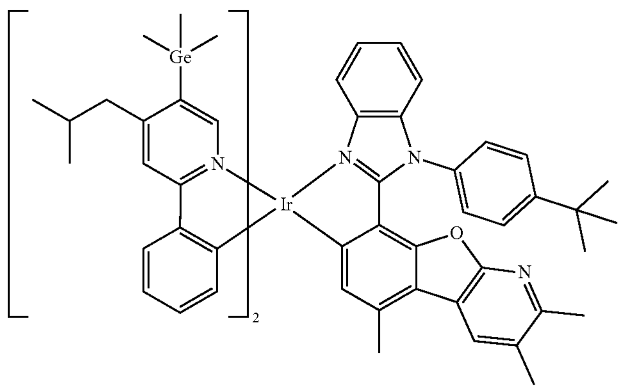
1917
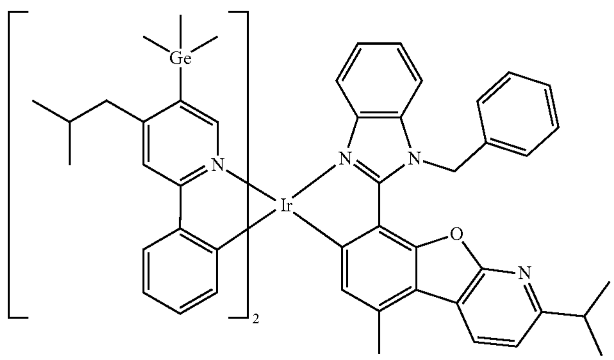

-continued
1918
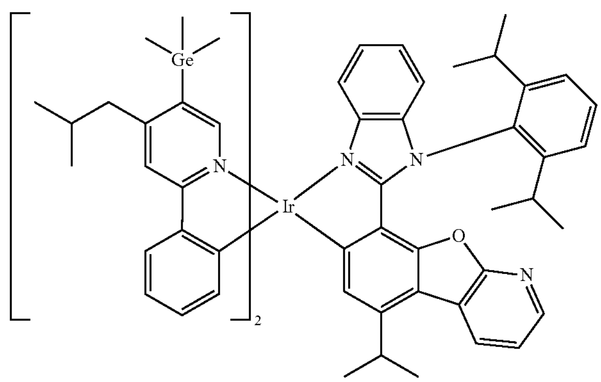
1919
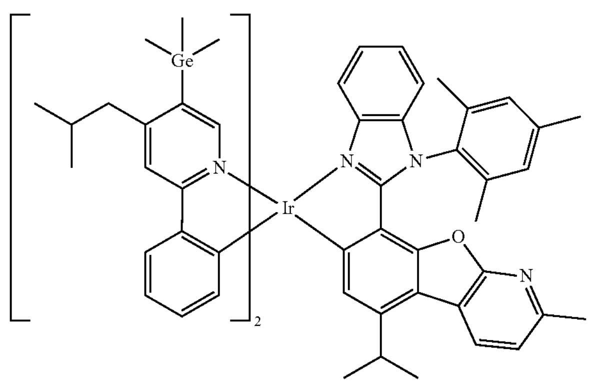
1920
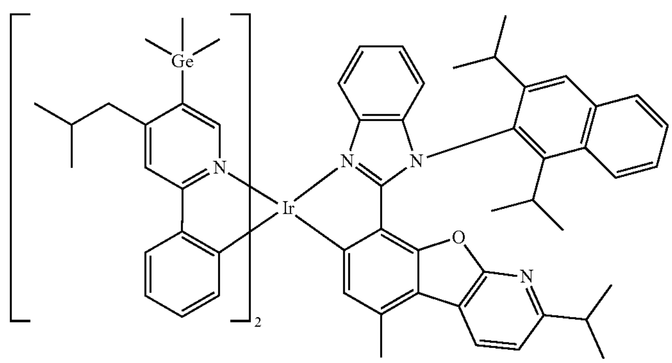
1921
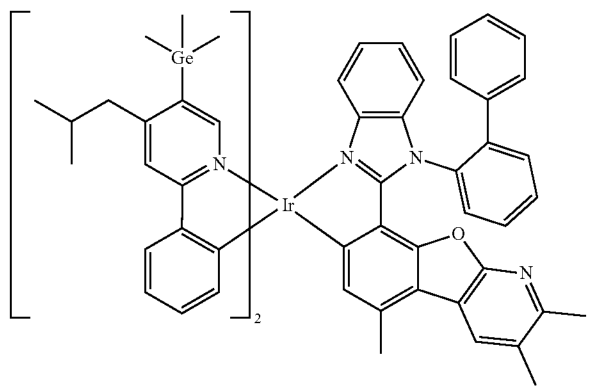

-continued
1922
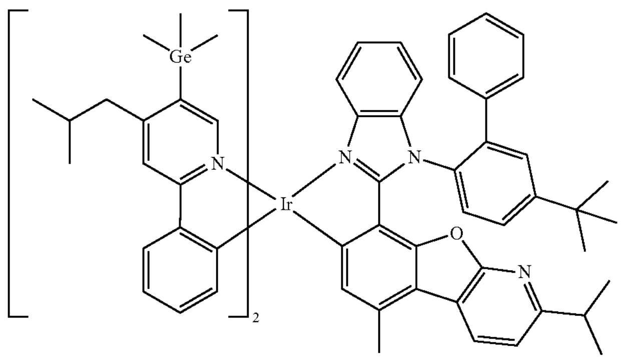
1923
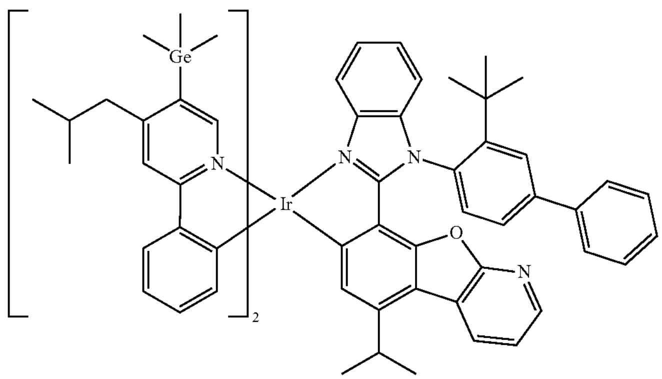
1924
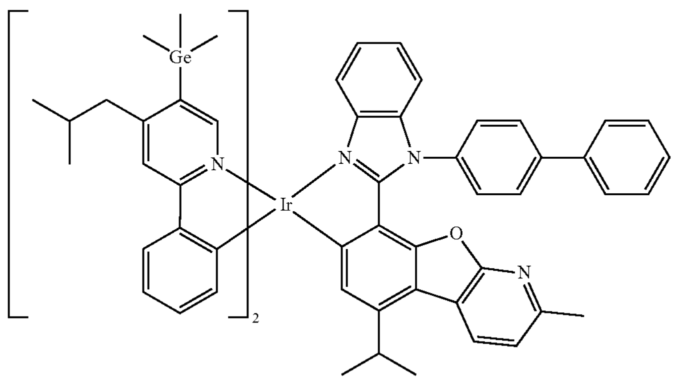
1925
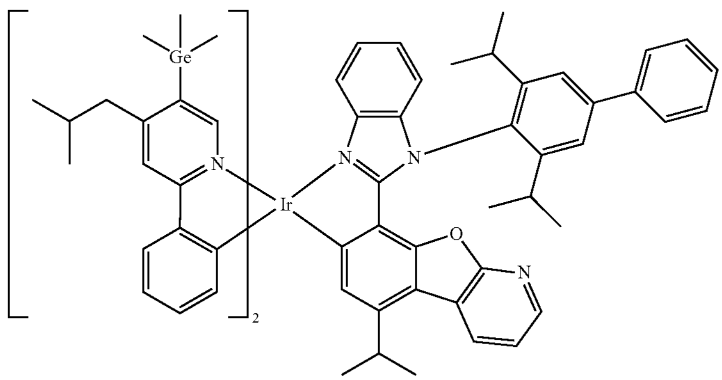

-continued
1926
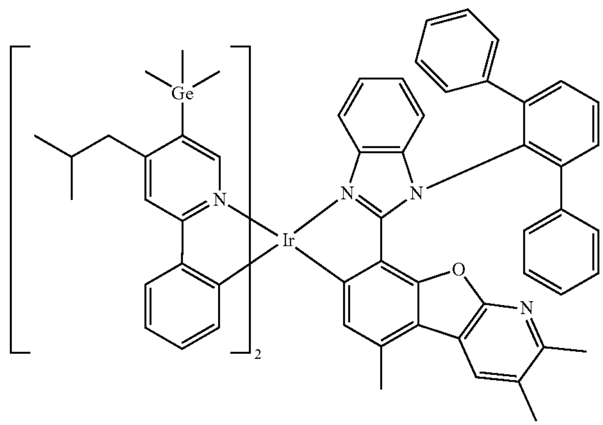
1927
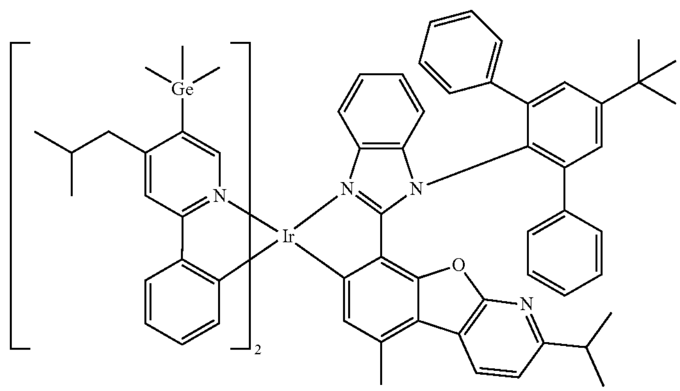
1928
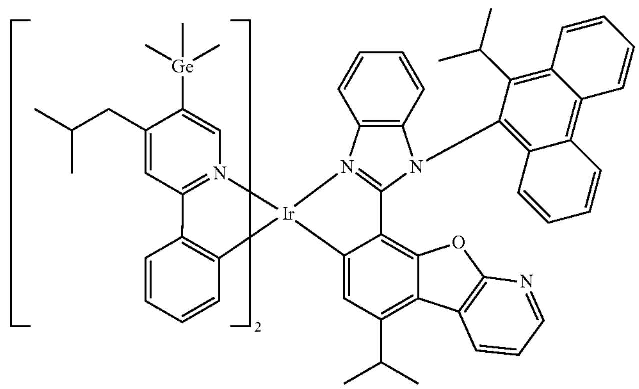
1929
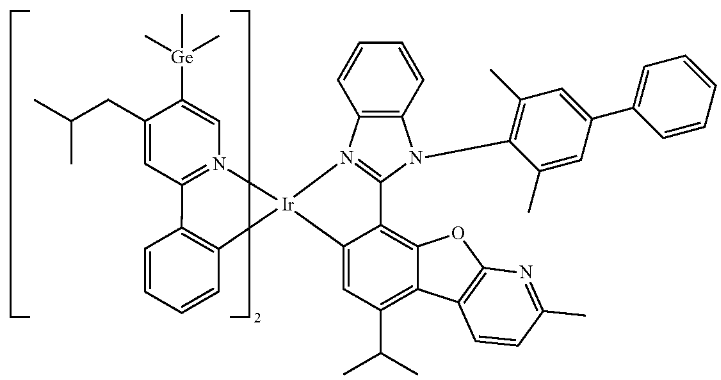

-continued
1930
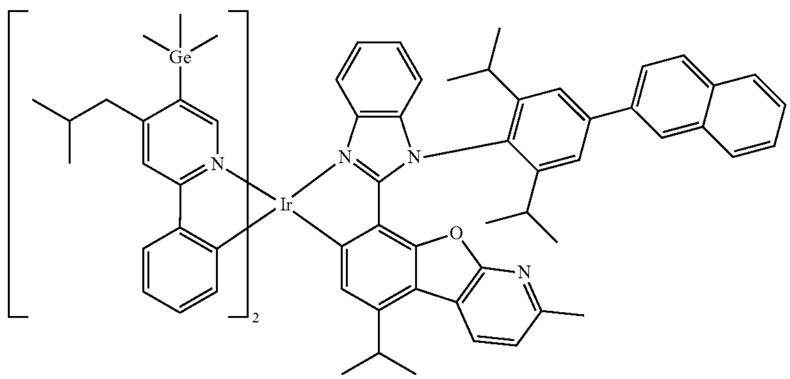
1931
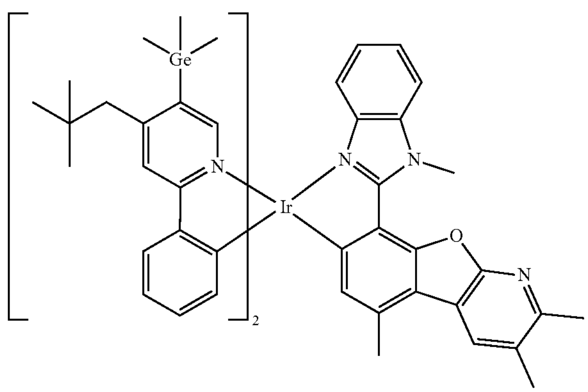
1932
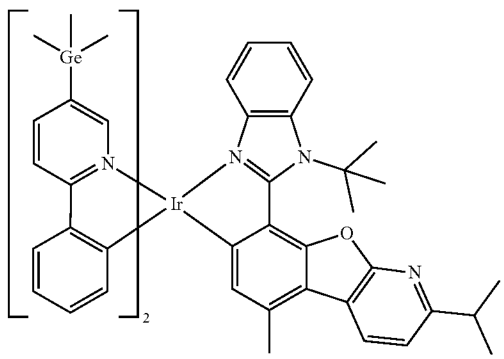
1933
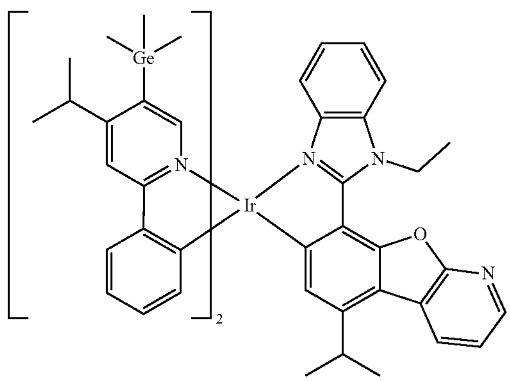

-continued
1934
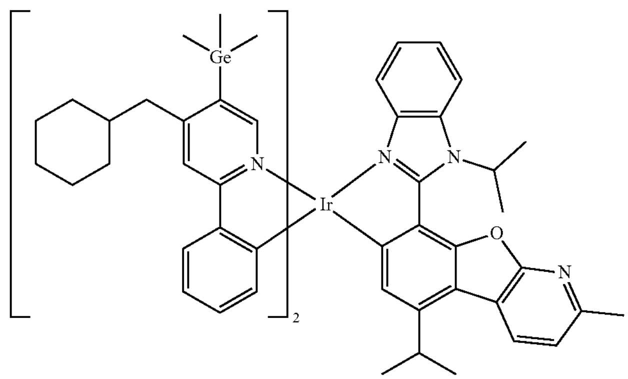
1935
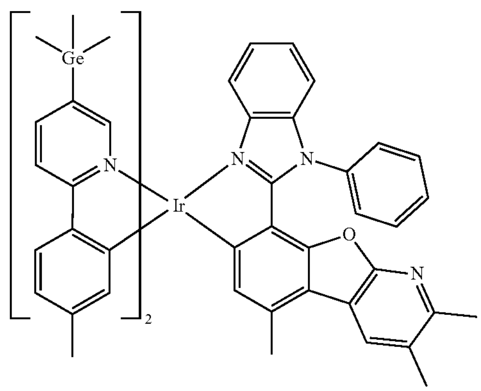
1936
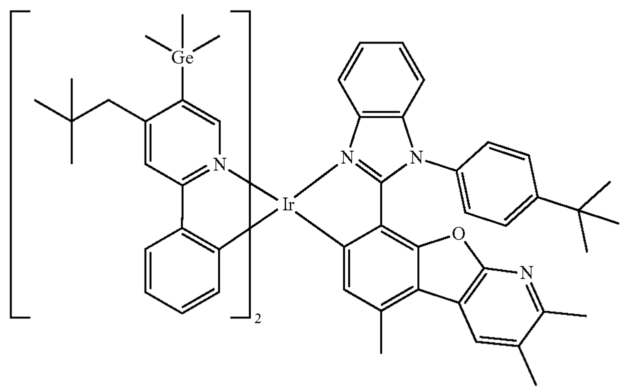
1937
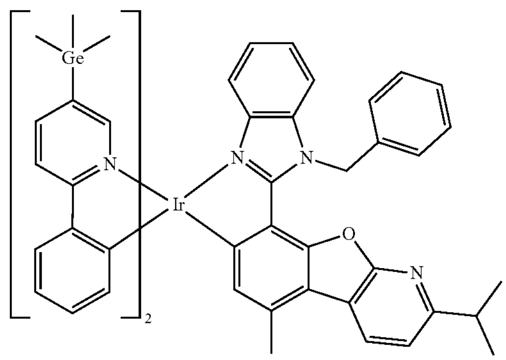

-continued
1938
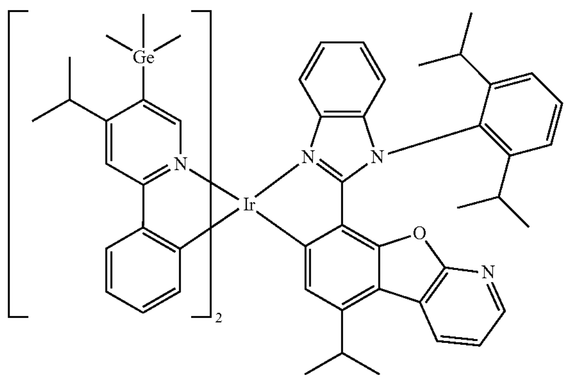
1939
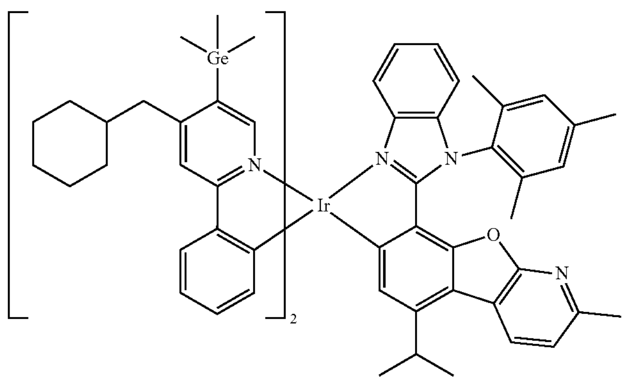
1940
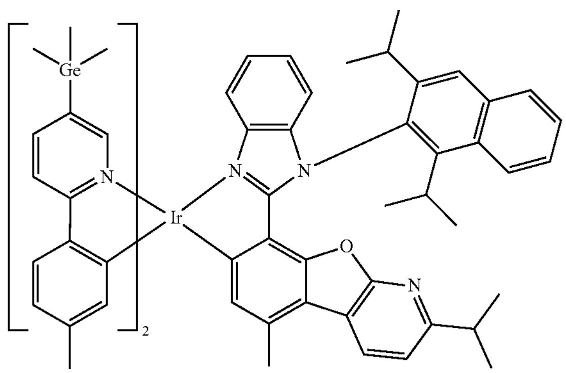
1941
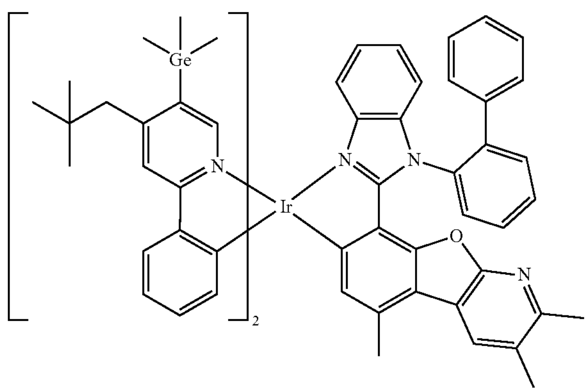

-continued
1942
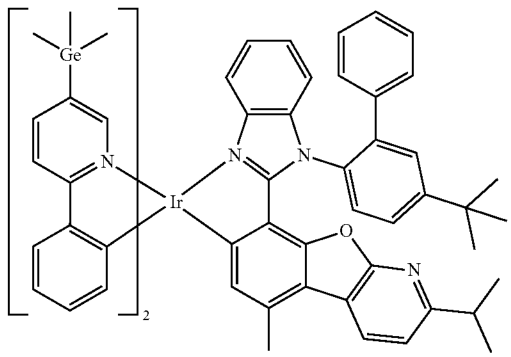
1943
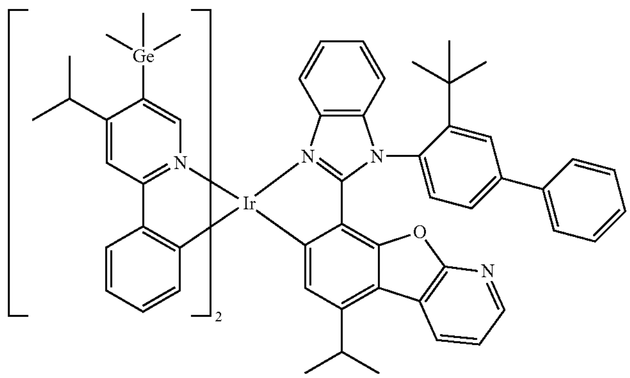
1944
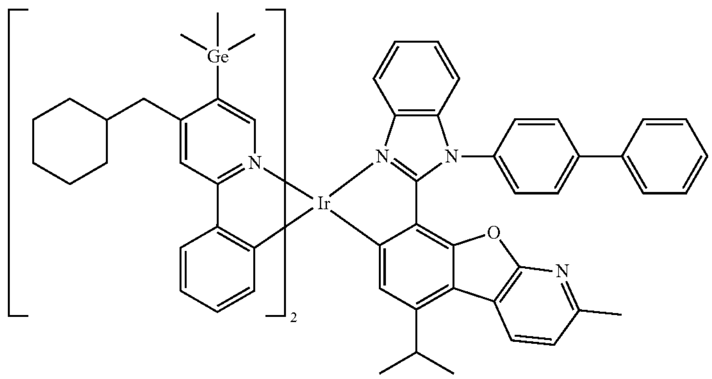
1945
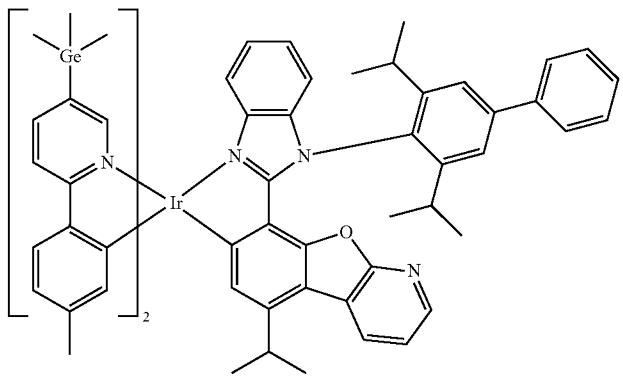

-continued
1946
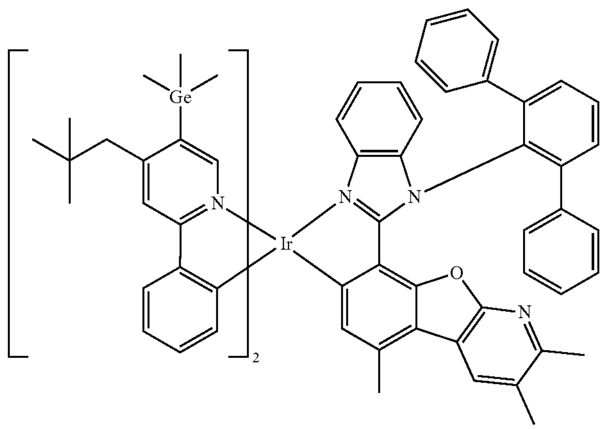
1947
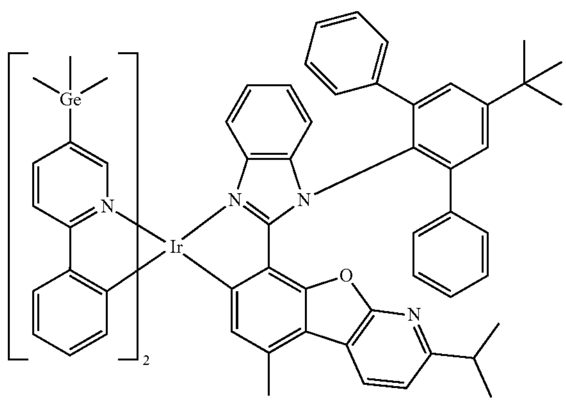
1948
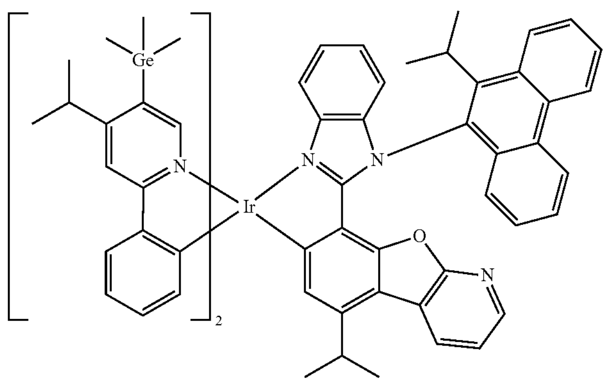
1949
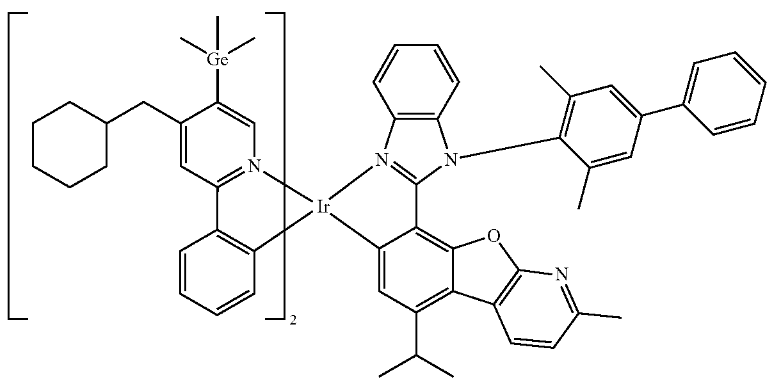

-continued
1950
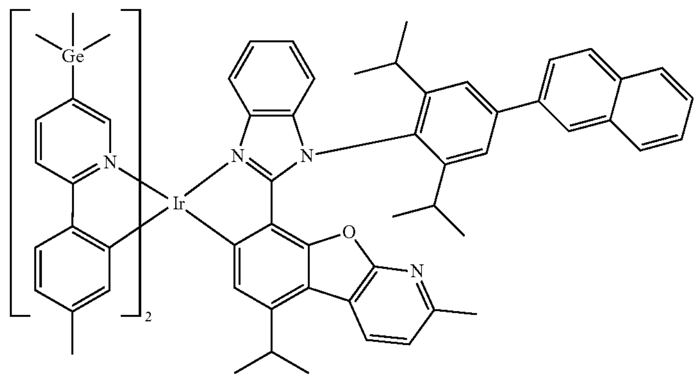
1951
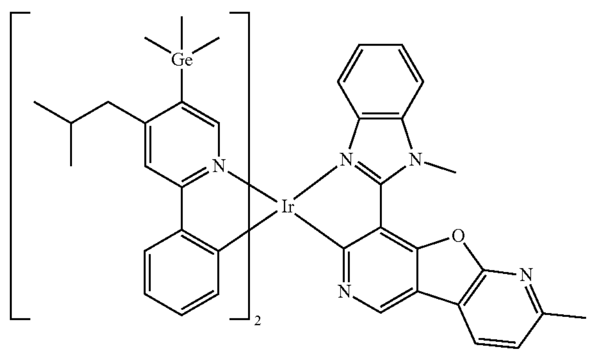
1952
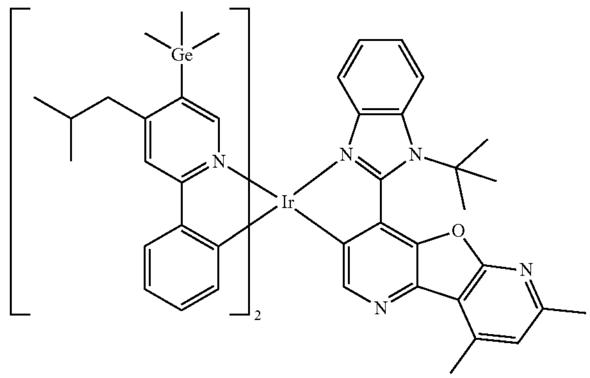
1953
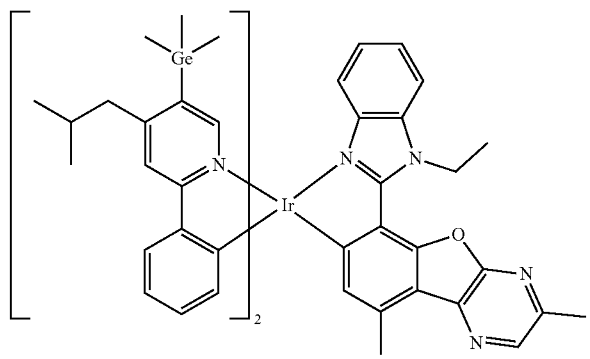

-continued
1954
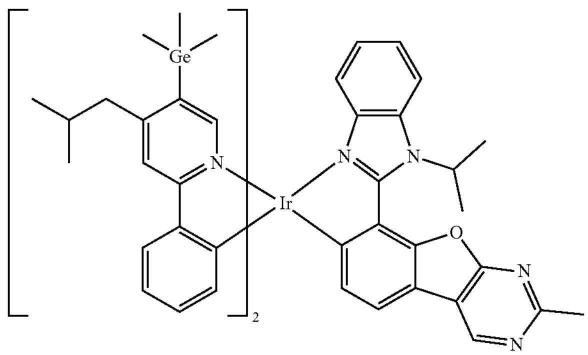
1955
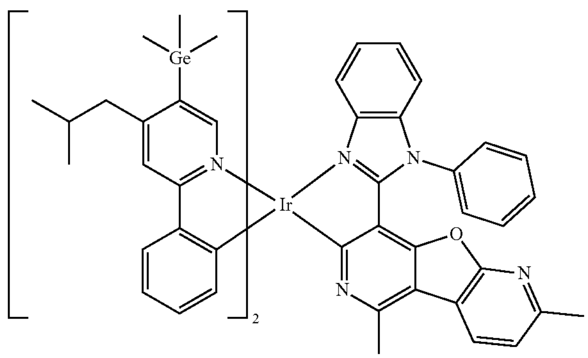
1956
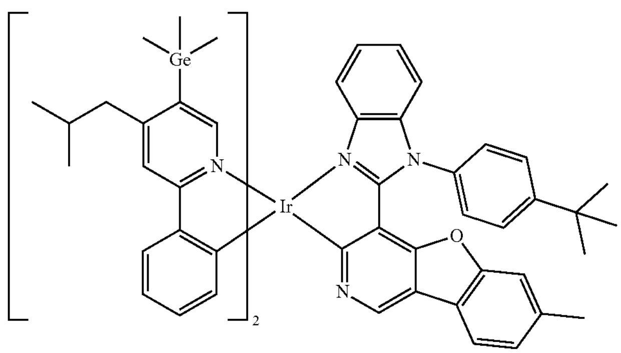
1957
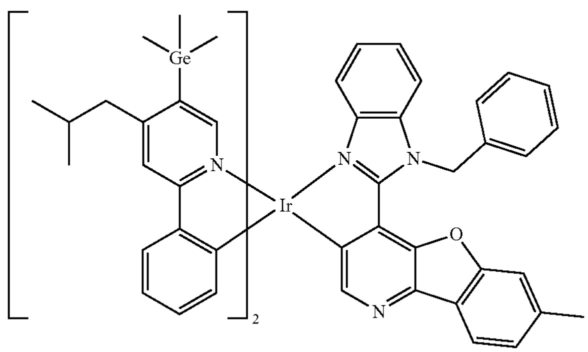

-continued
1958
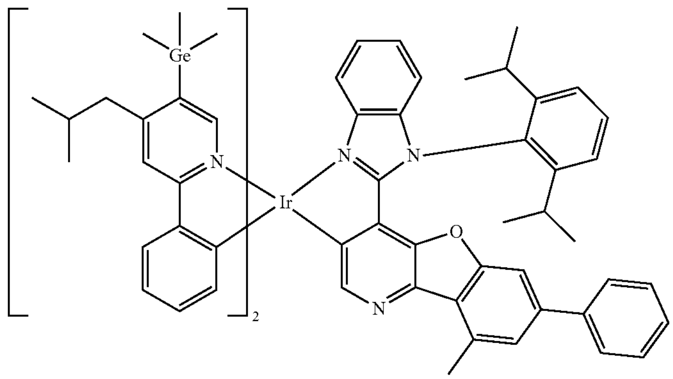
1959
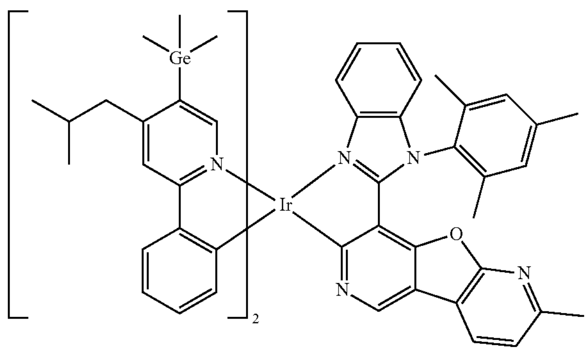
1960
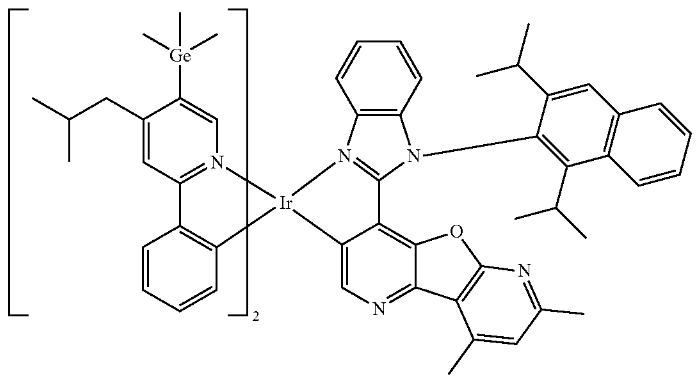
1961
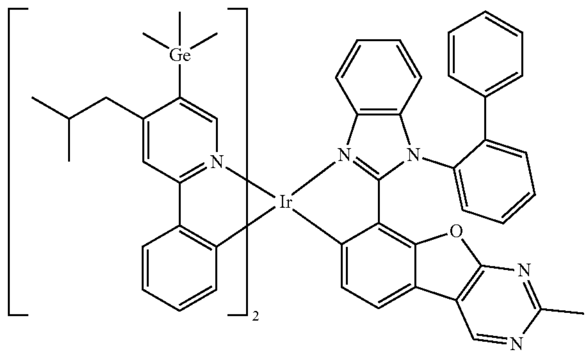

-continued
1962
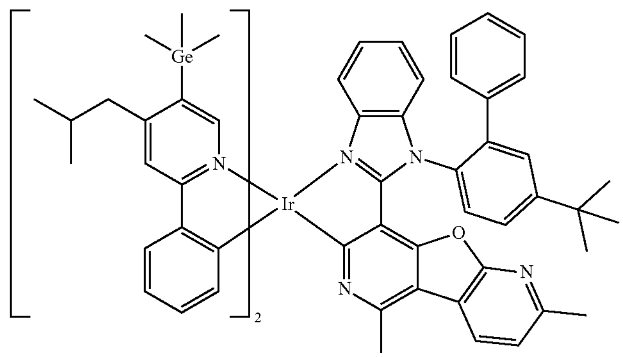
1963
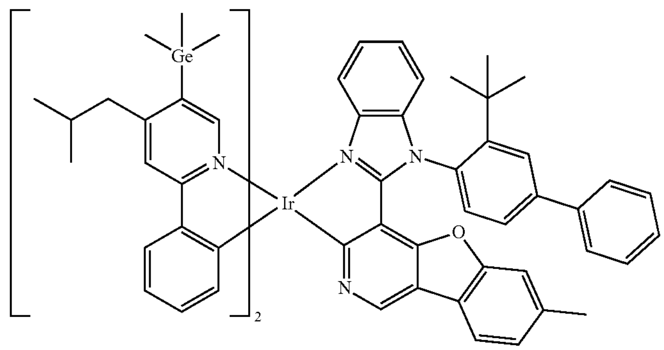
1964
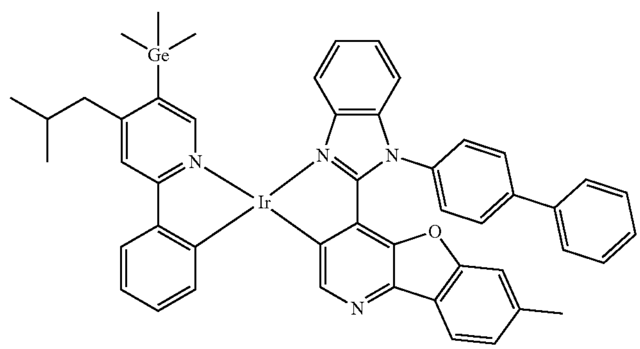
1965
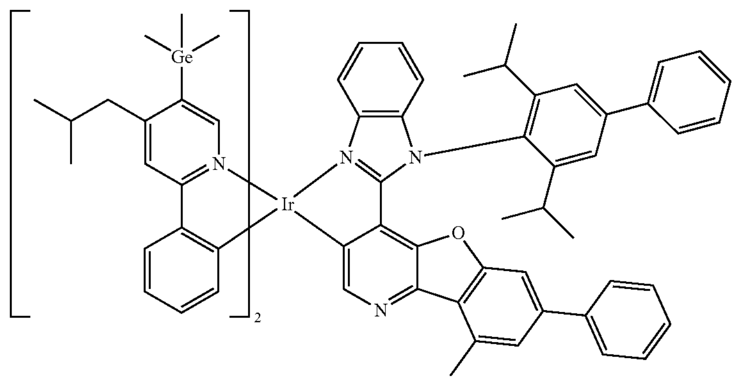

-continued
1966
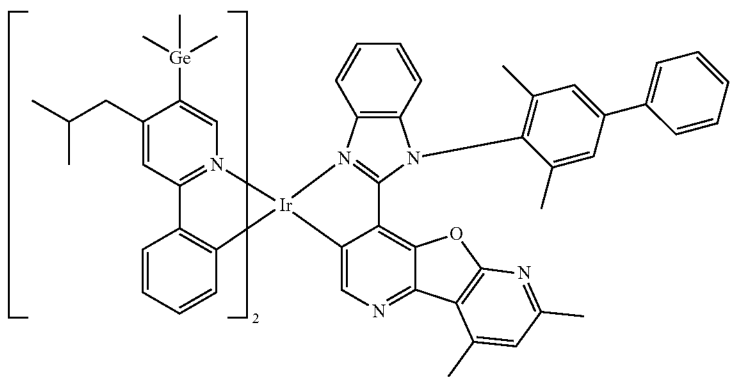
1967
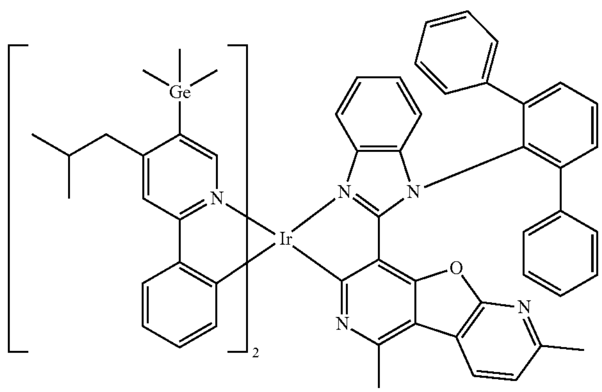
1968
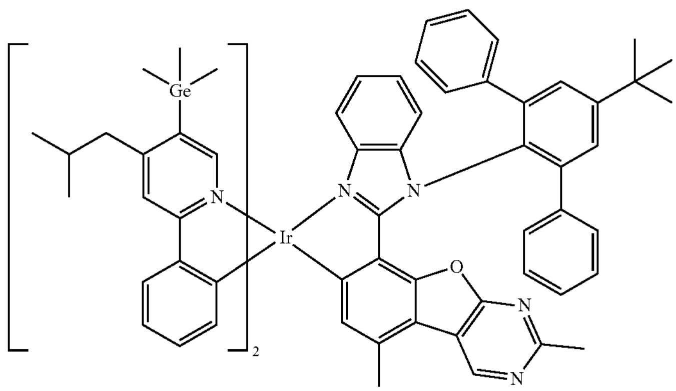
1969
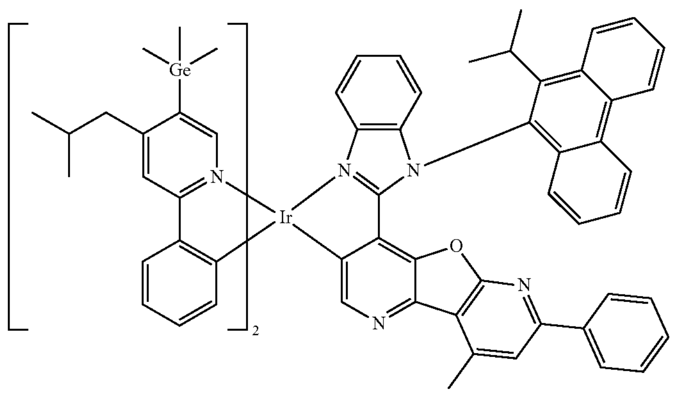

-continued
1970
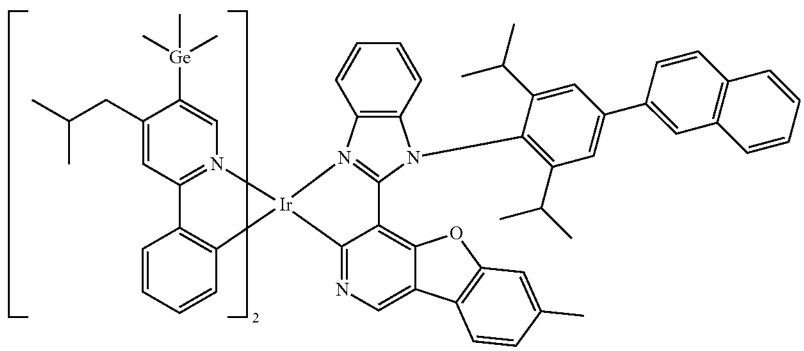
1971
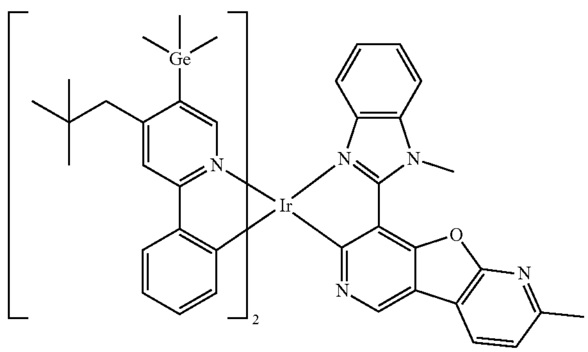
1972
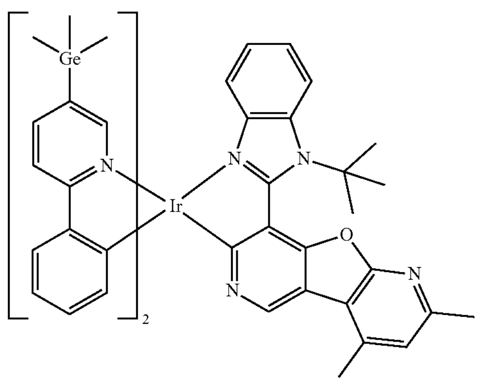
1973
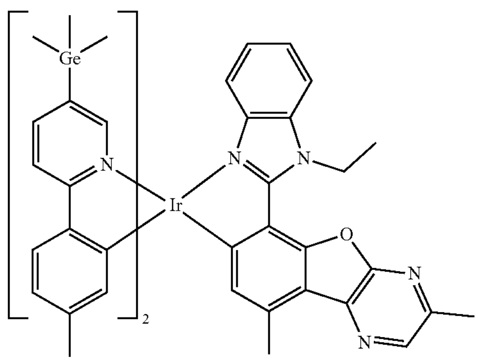

-continued
1974
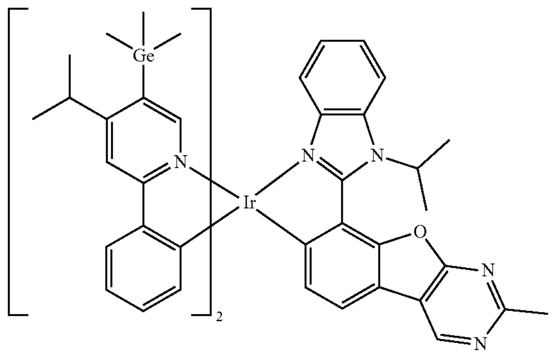
1975
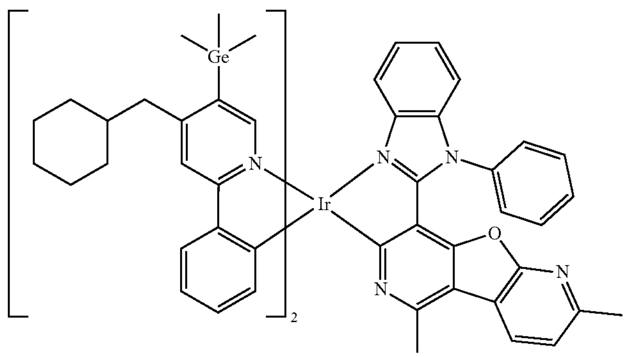
1976
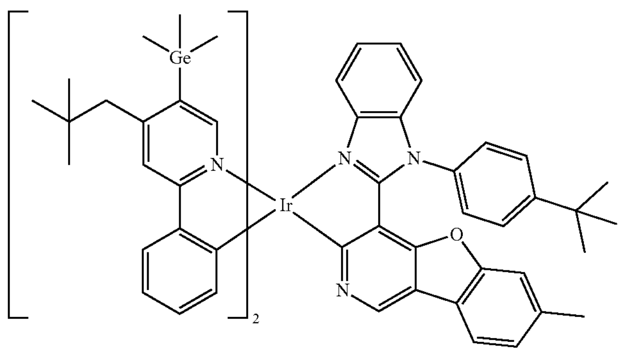
1977
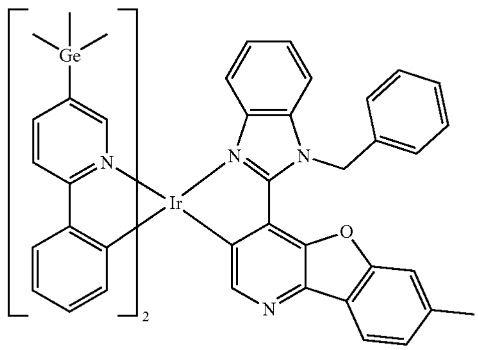

-continued
1978
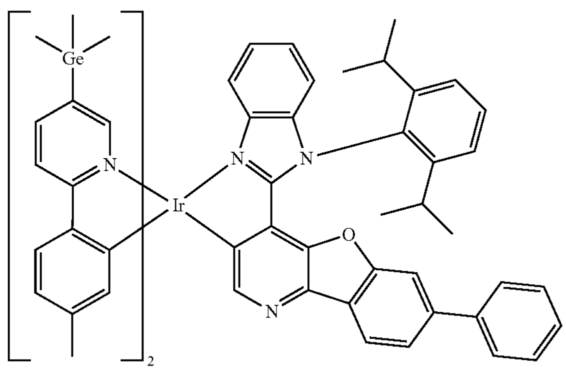
1979
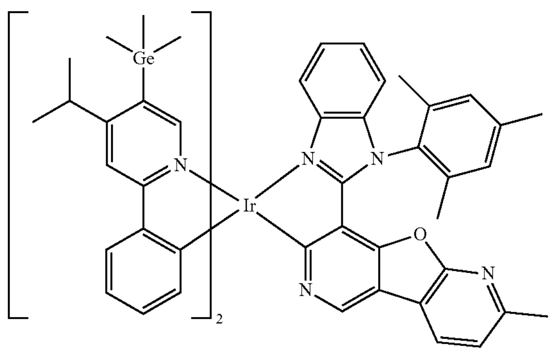
1980
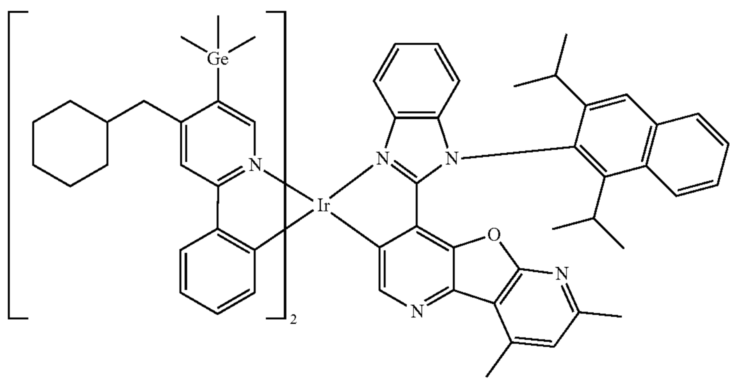
1981
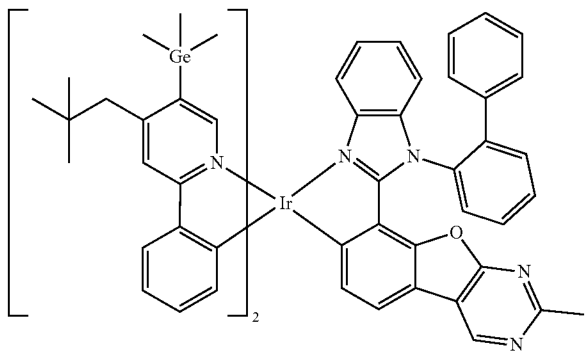

-continued
1982
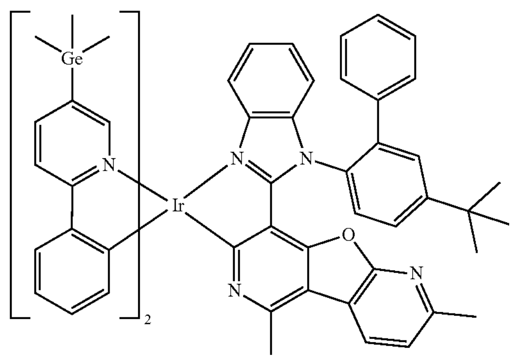
1983
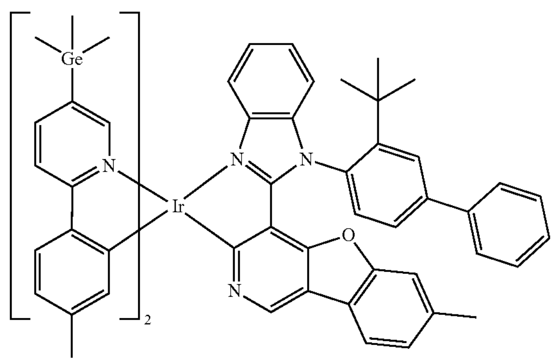
1984
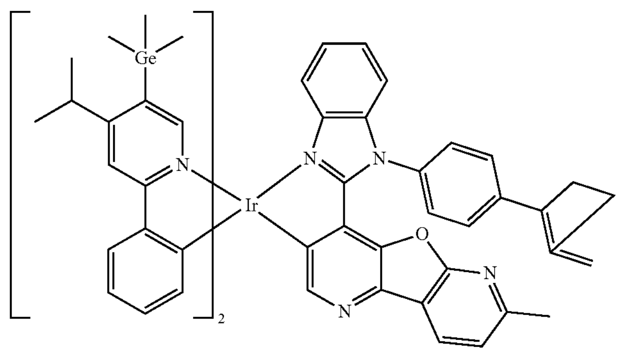
1985
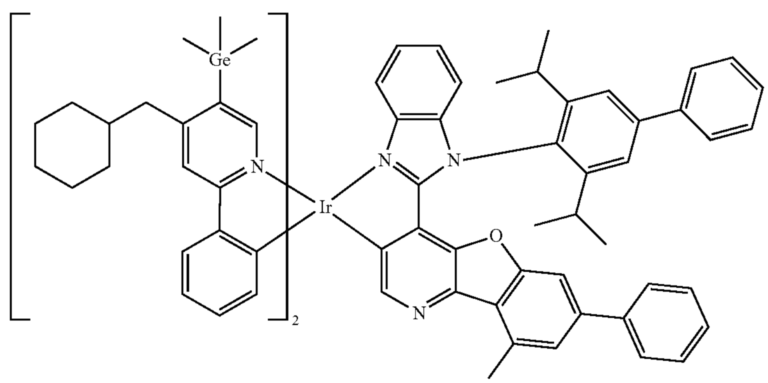

-continued
1986
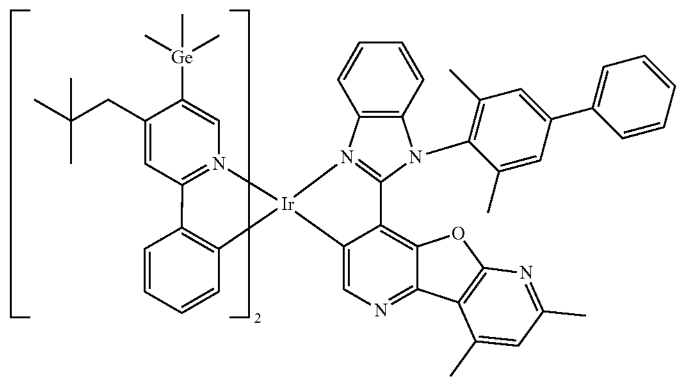
1987
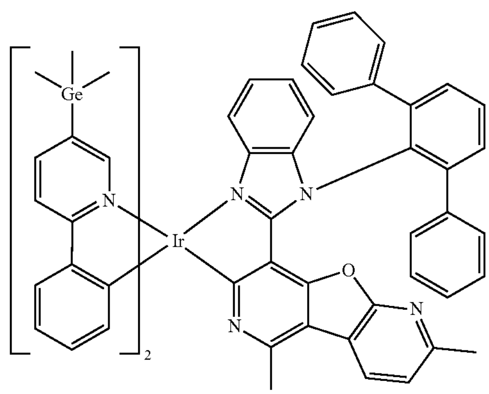
1988
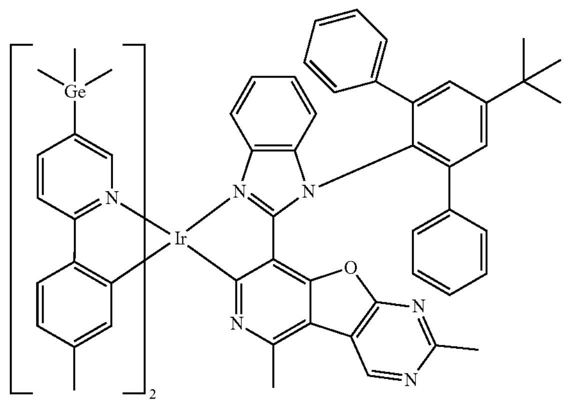
1989
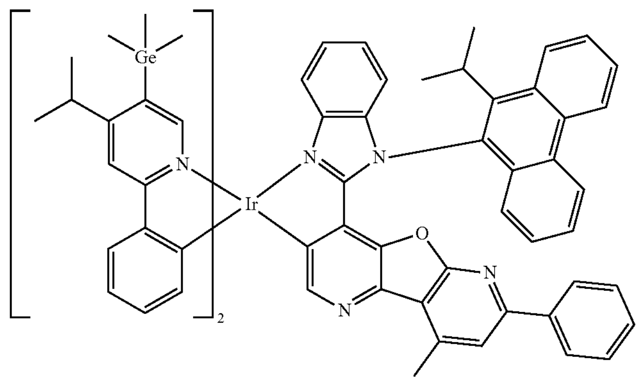

-continued
1990
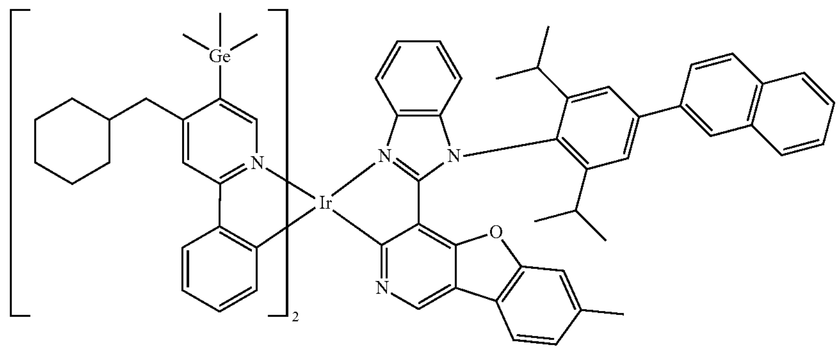
1991
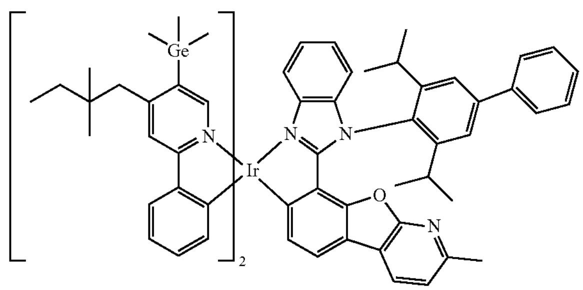
1992
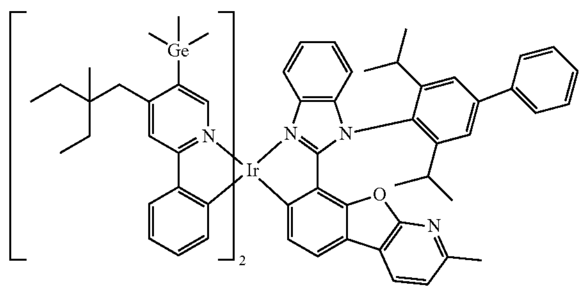
1993
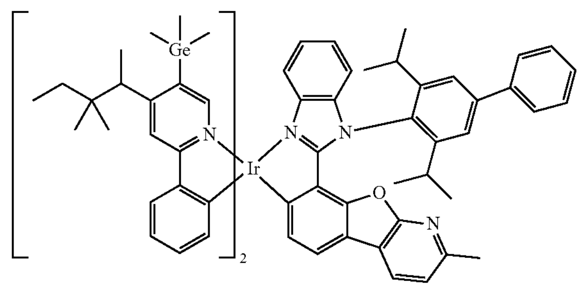

-continued
1994
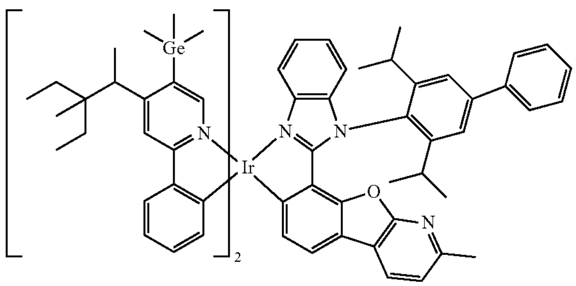
1995
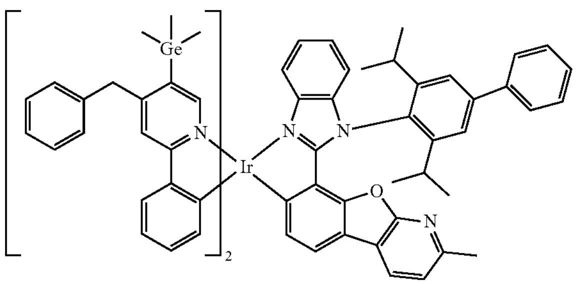
1996
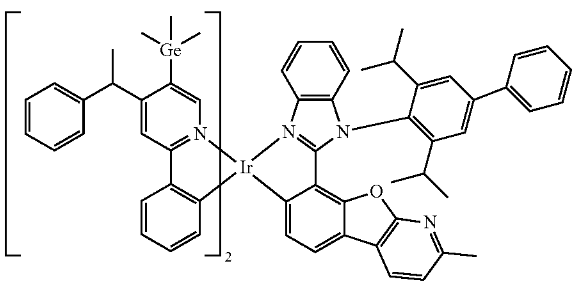
1997
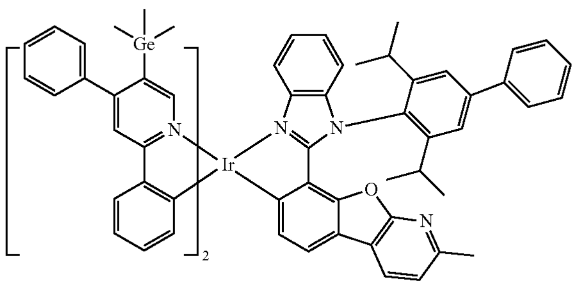
1998
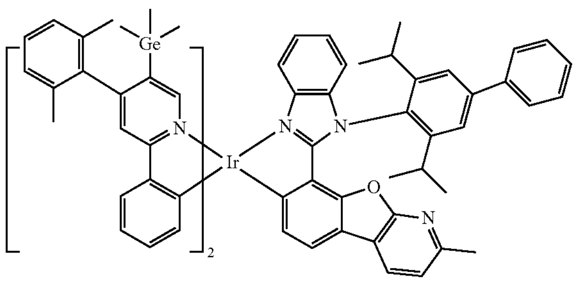

-continued
1999
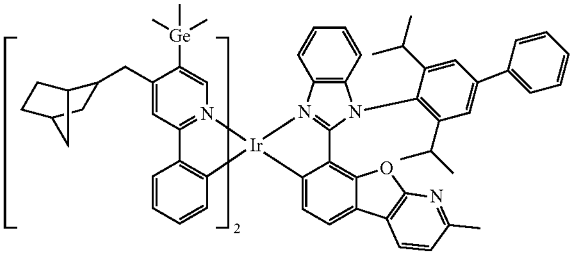
2000
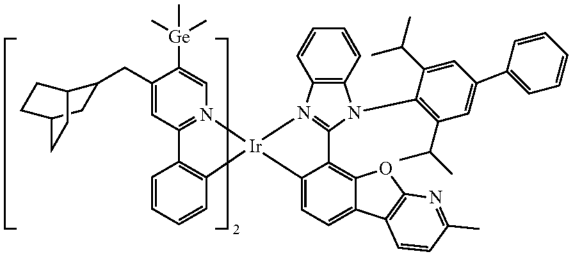
2001
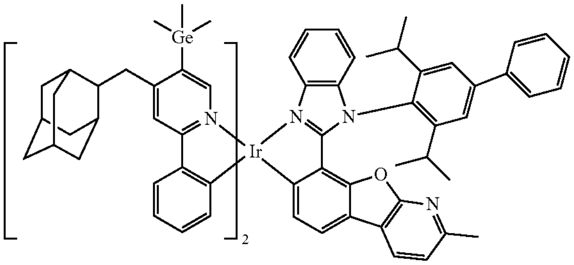
2002
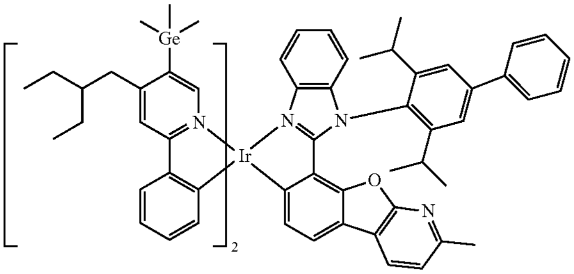
2003
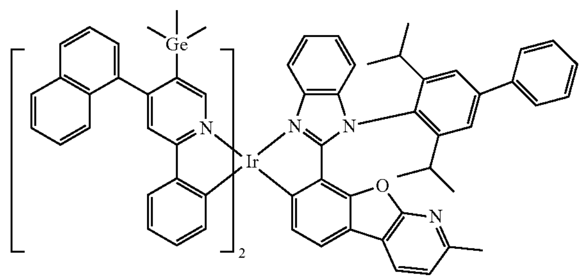

-continued
2004
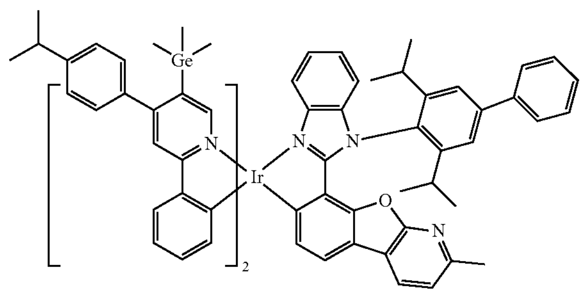
2005
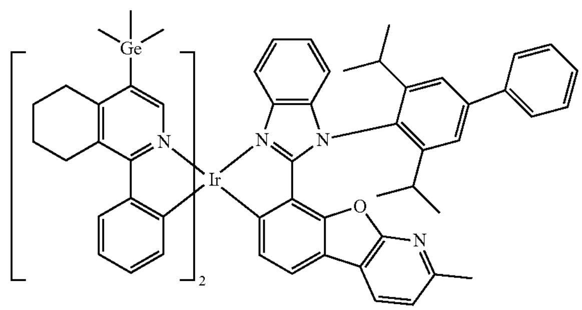
2006
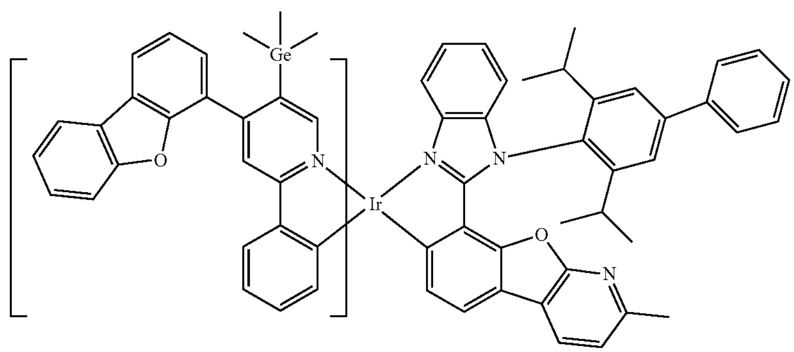
2007
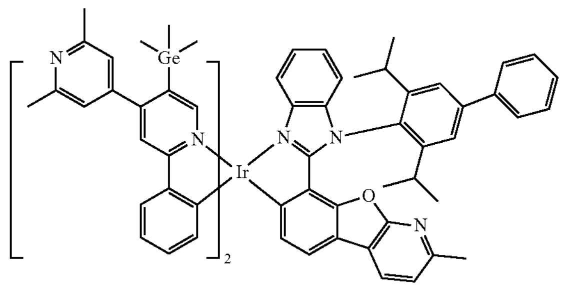
2008
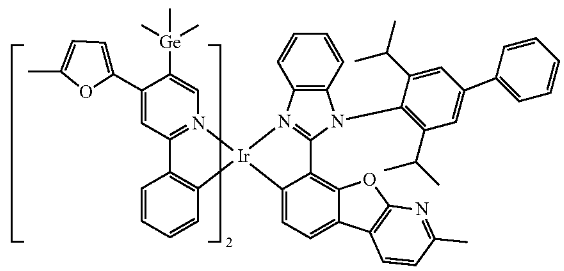
2009
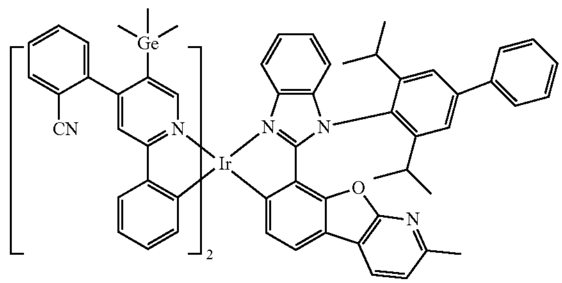
2010
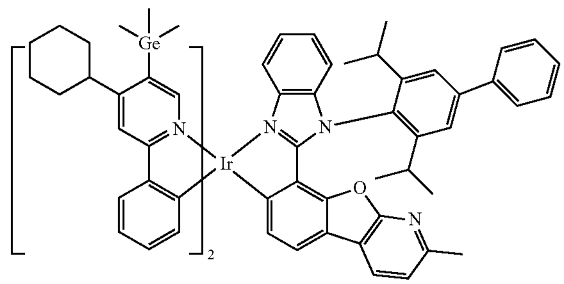

-continued
2011
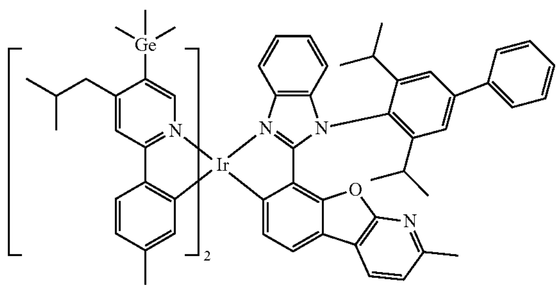
2012
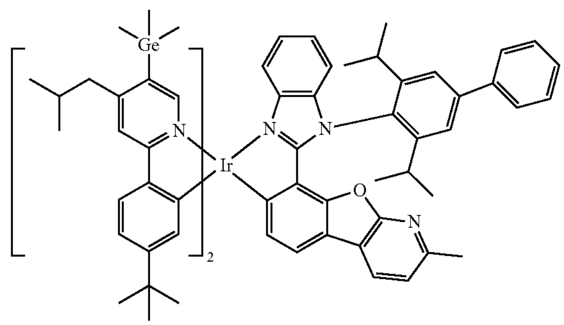
2013
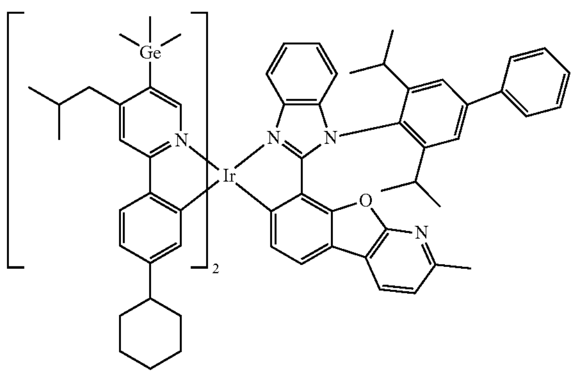
2014
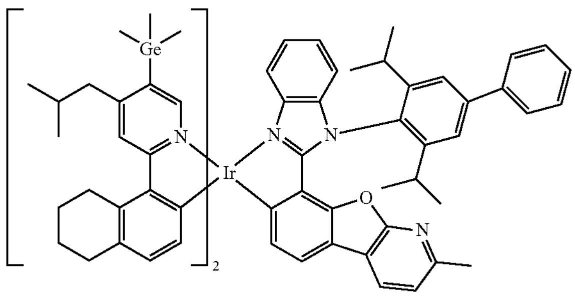
2015
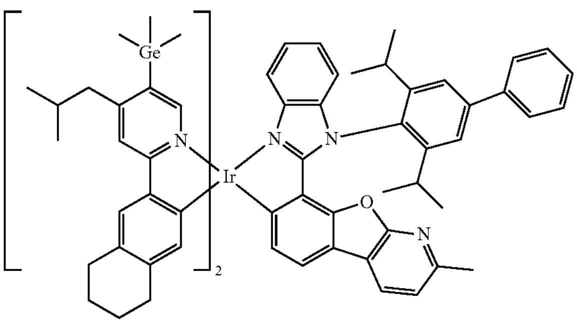

-continued
2016
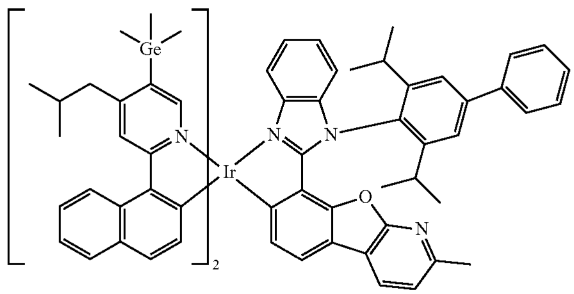
2017
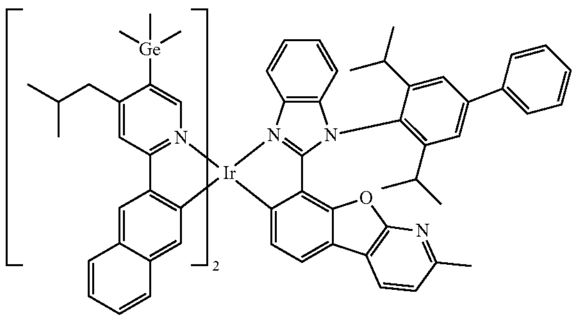
2018
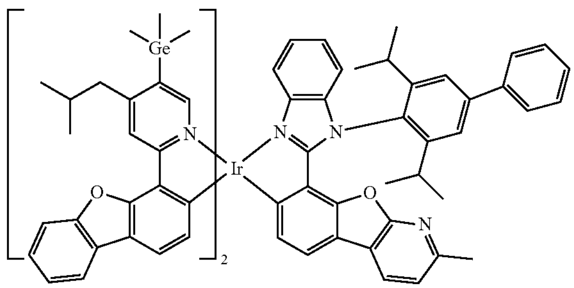
2019
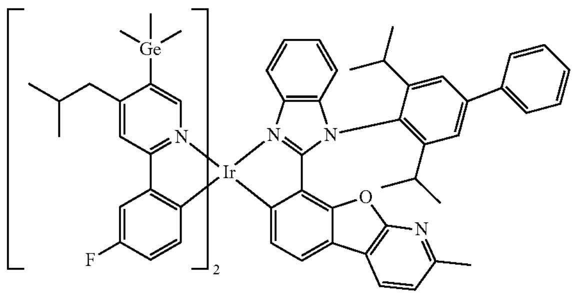
2020
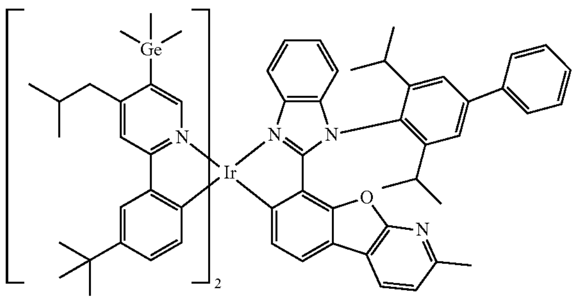

-continued
2021
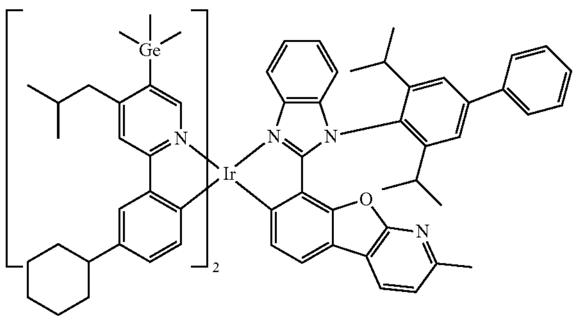
2022
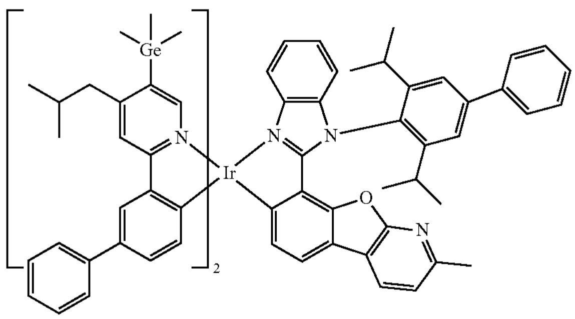
2023
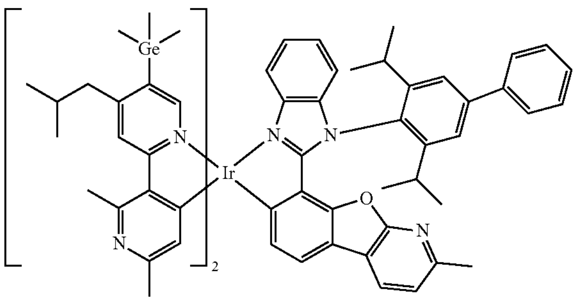
2024
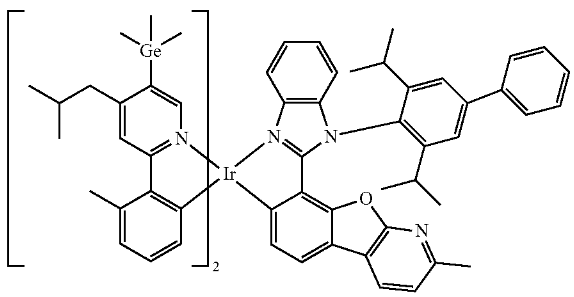
2025
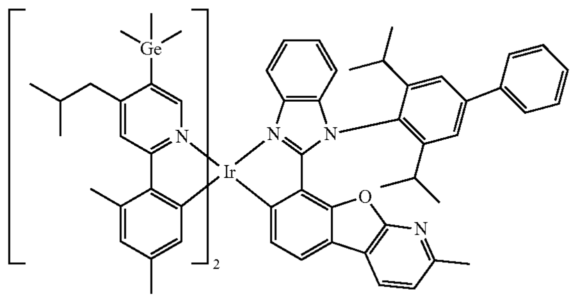

-continued
2026
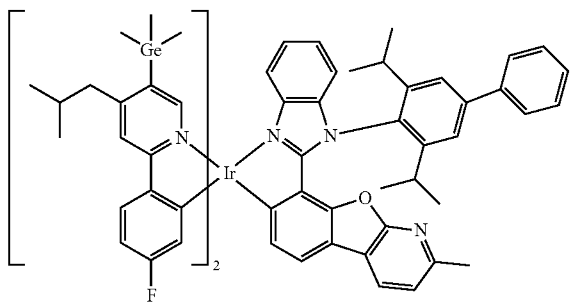
2027
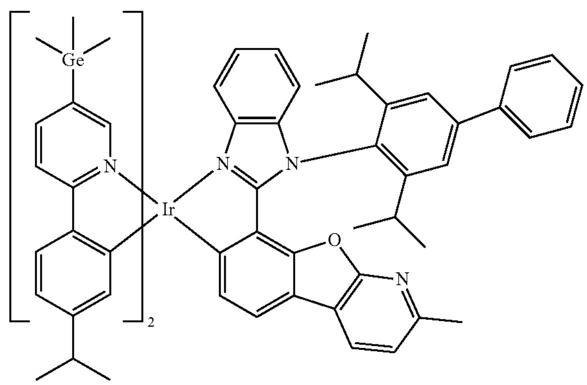
2028
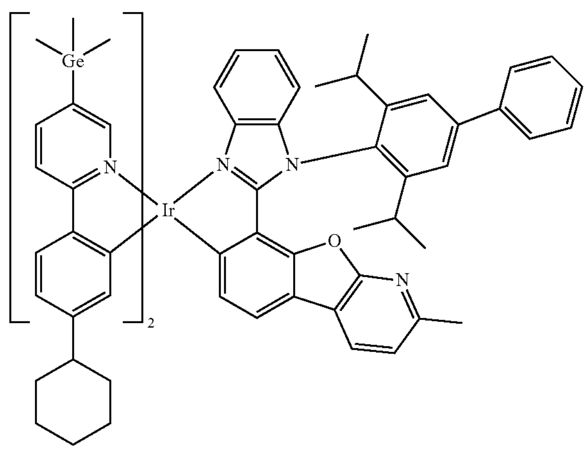
2029
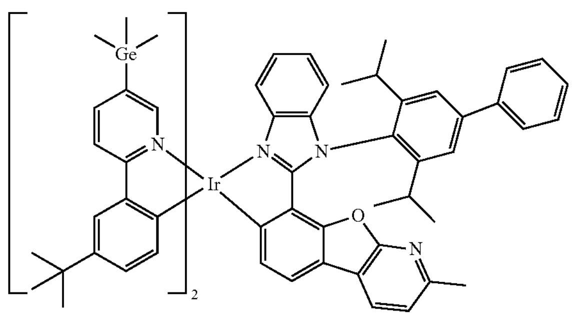

-continued
2030
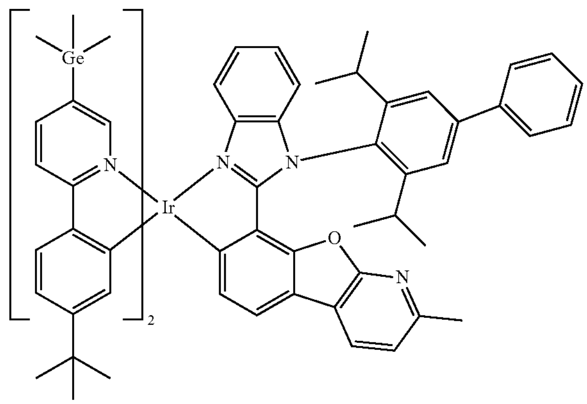
2031
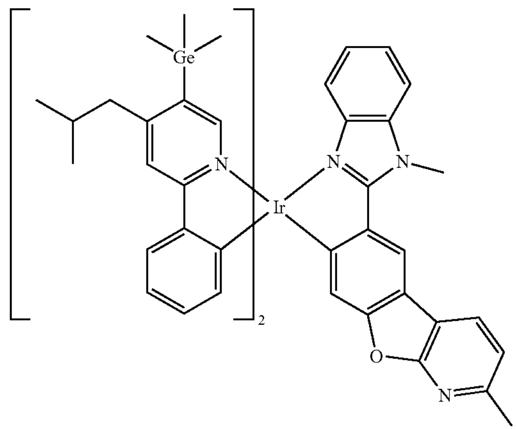
2032
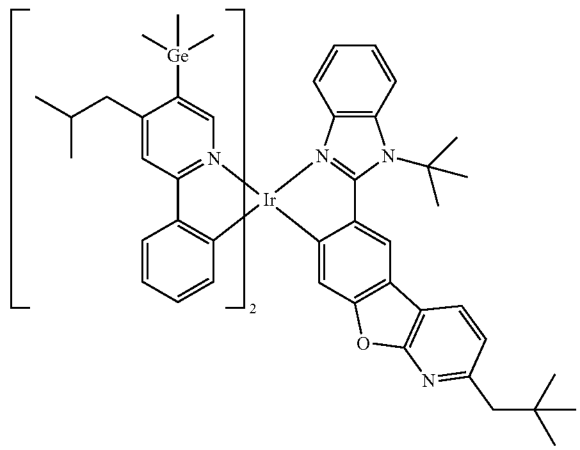

-continued
2033
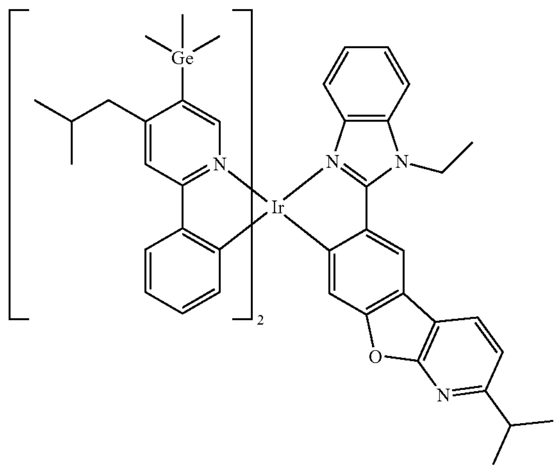
2034
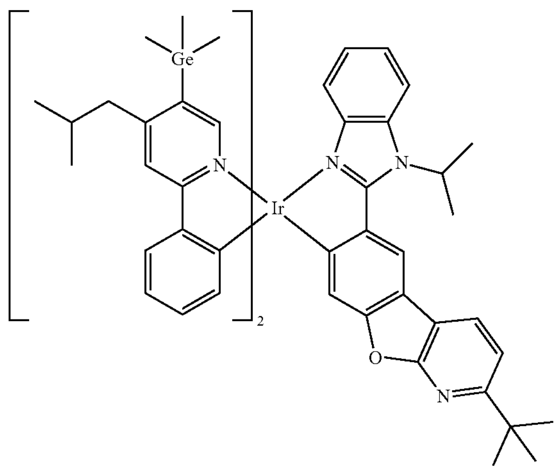
2035
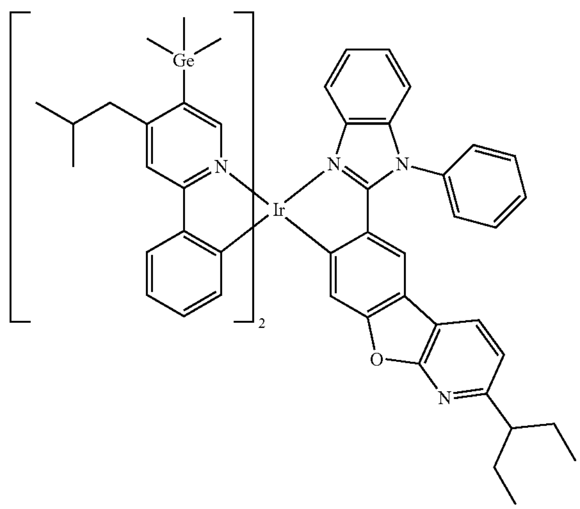

-continued
2036
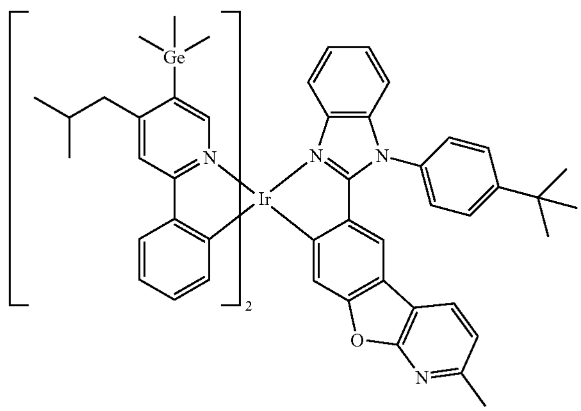
2037
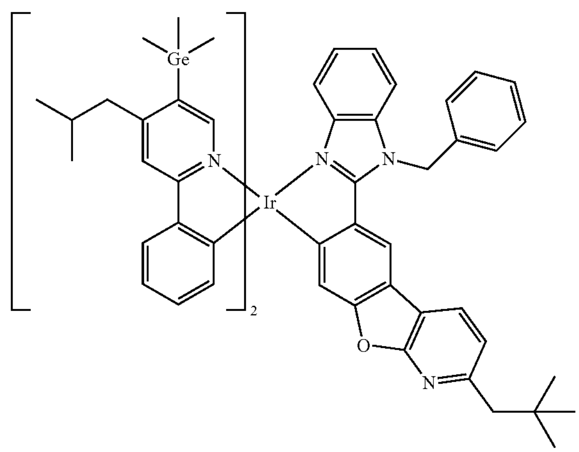
2038
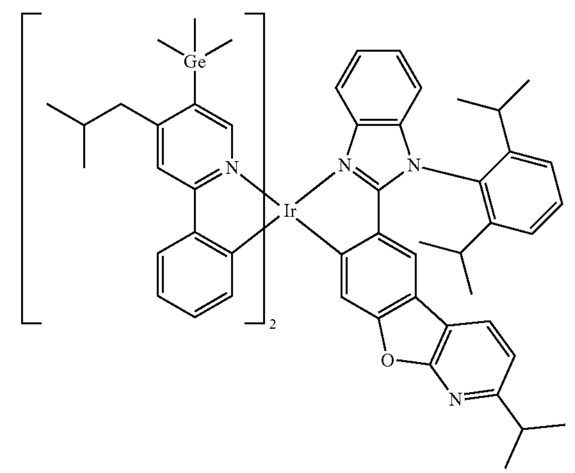

-continued
2039
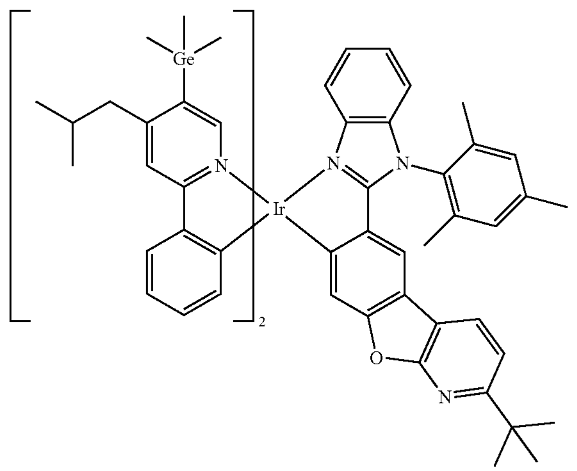
2040
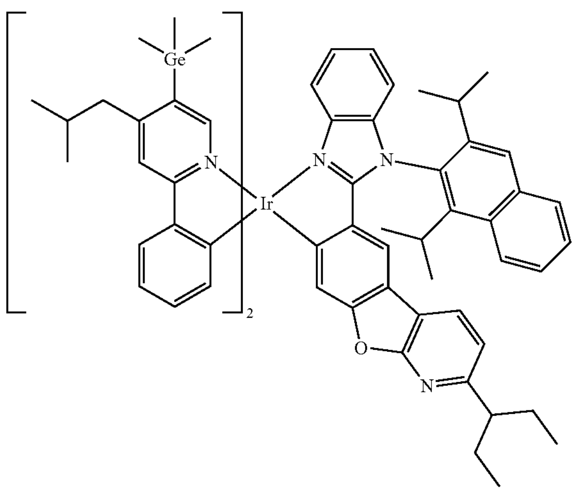
2041
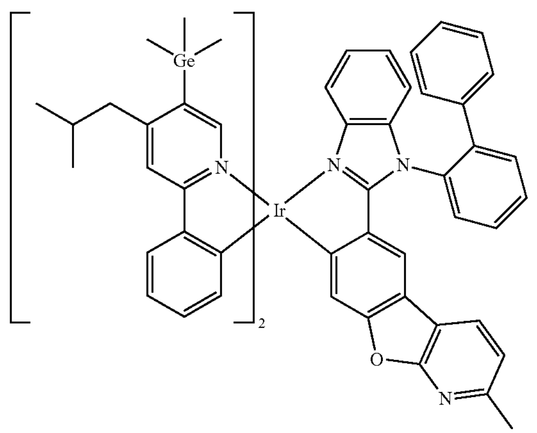

-continued
2042
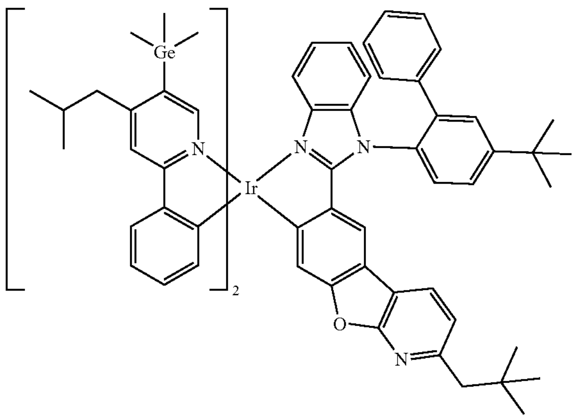
2043
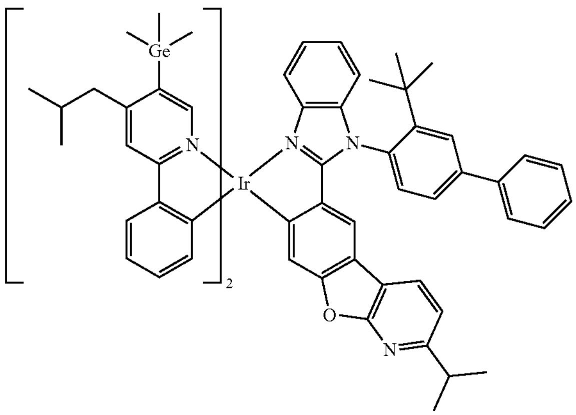
2044
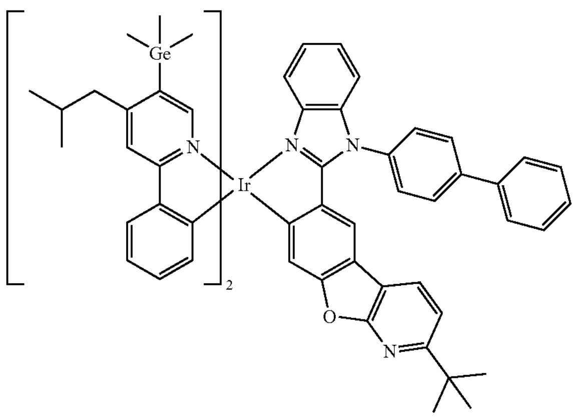

-continued
2045
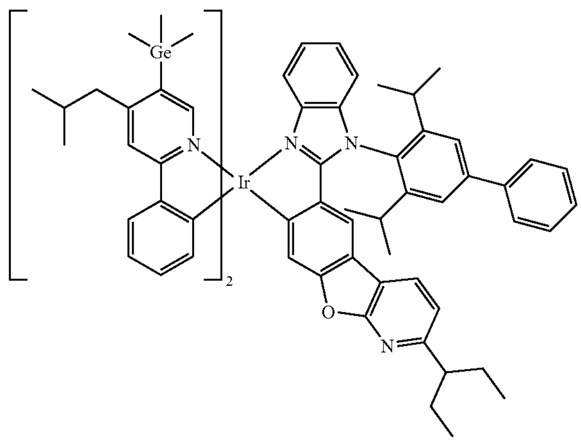
2046
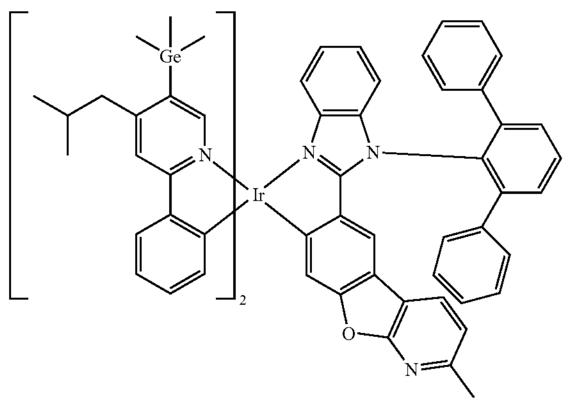
2047
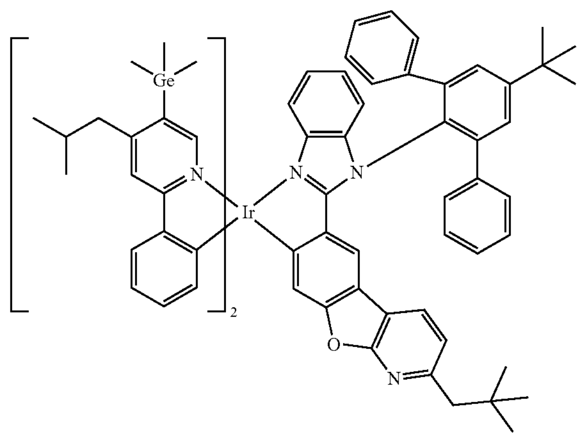

-continued
2048
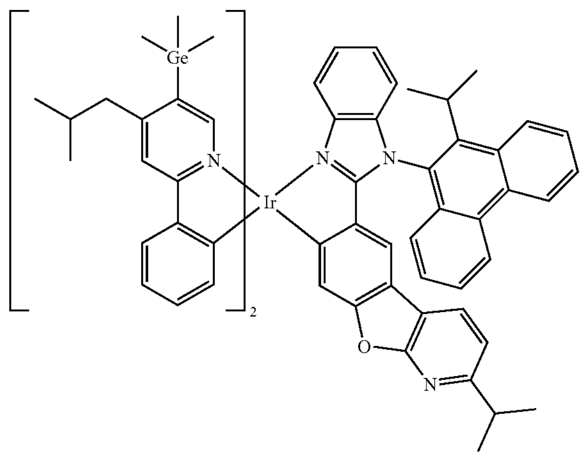
2049
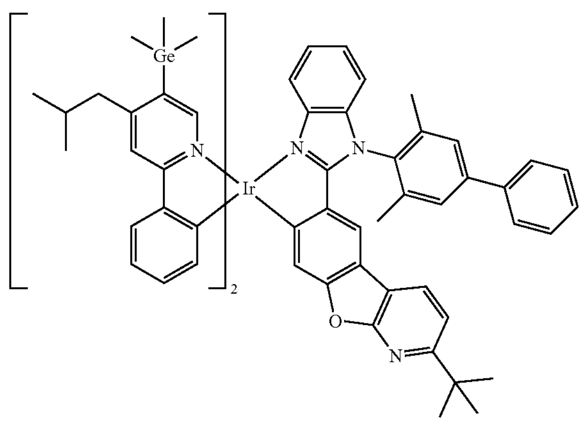
2050
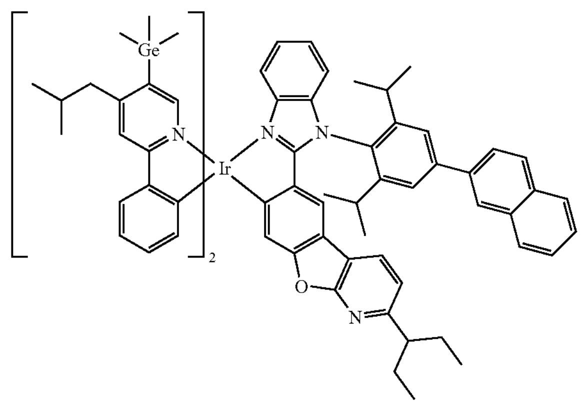

-continued
2051
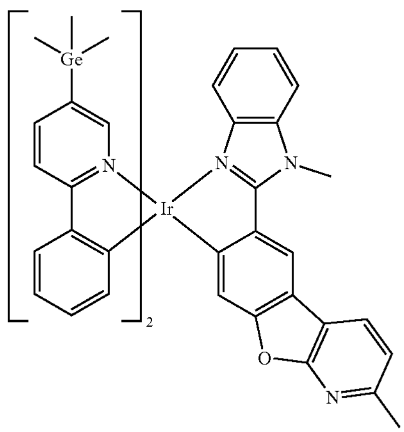
2052
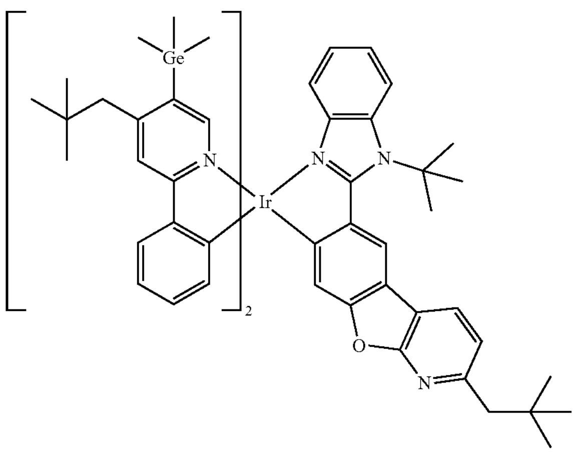
2053
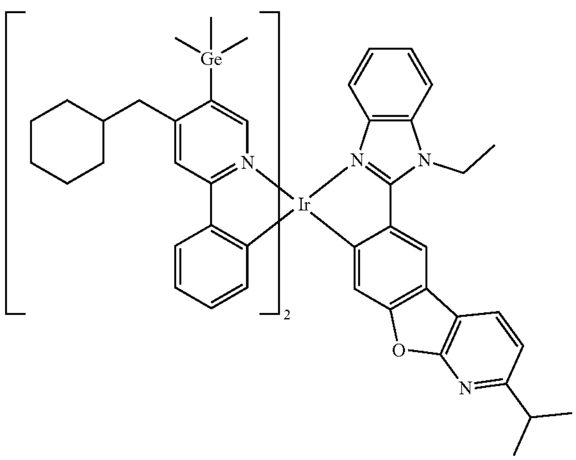

-continued
2054
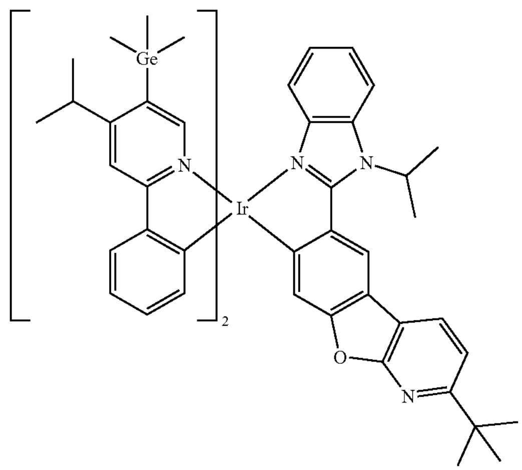
2055
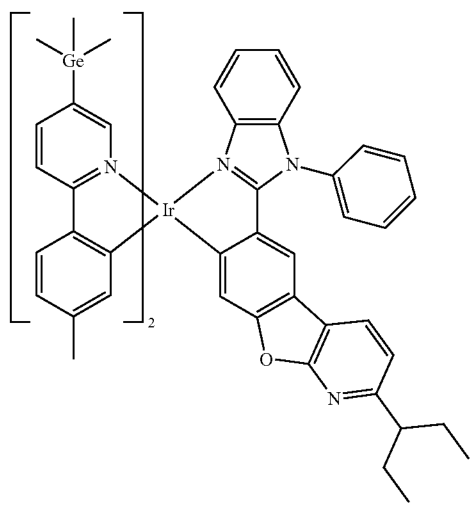
2056
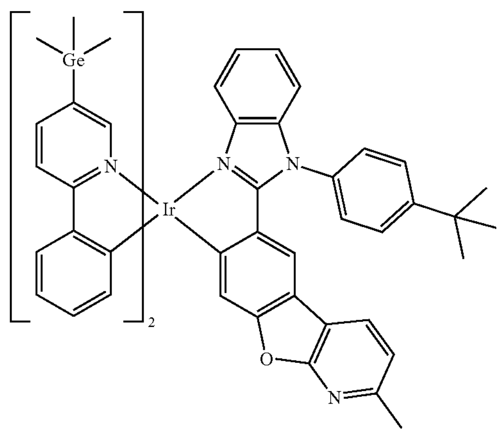

-continued
2057
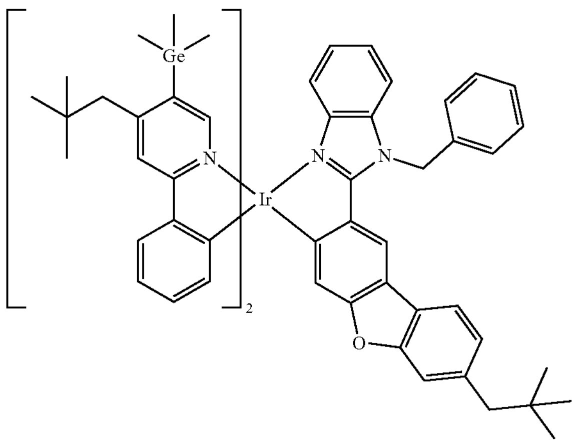
2058
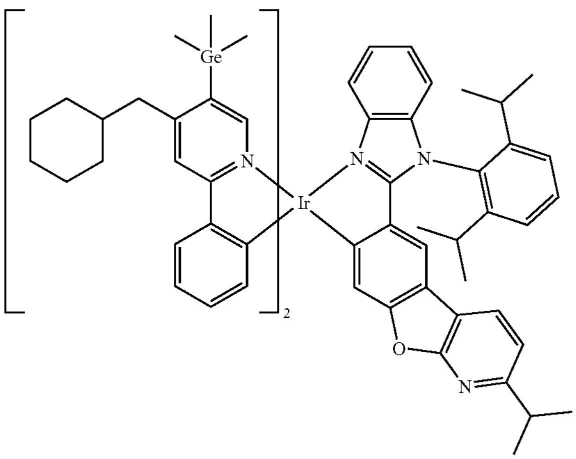
2059
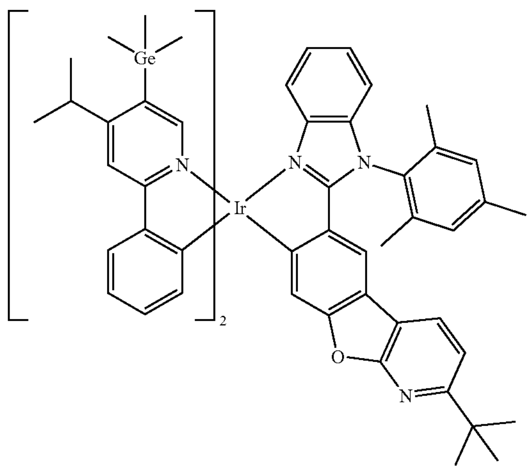

-continued
2060
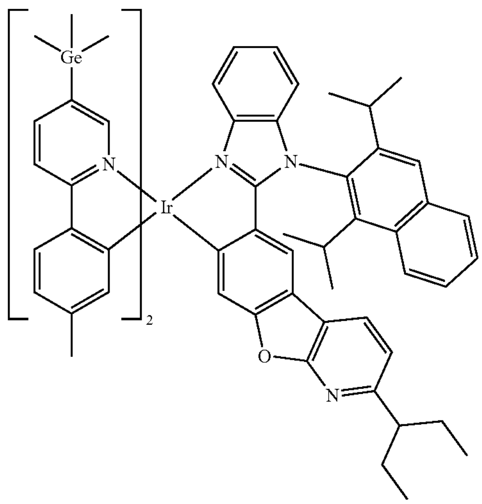
2061
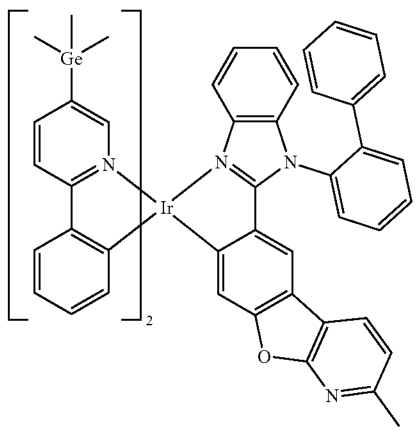
2060
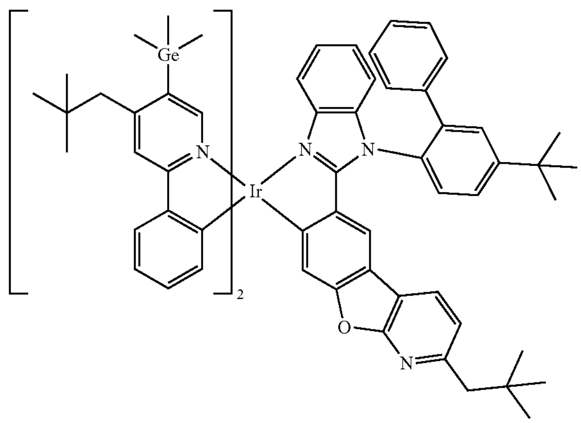

-continued
2063
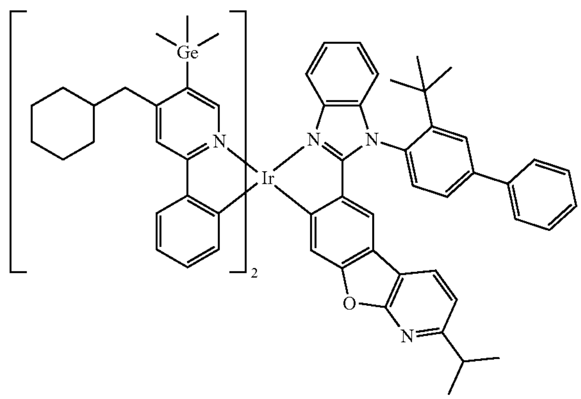
2064
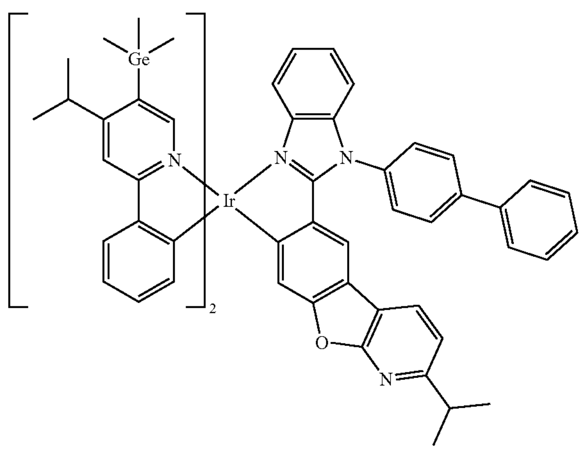
2065
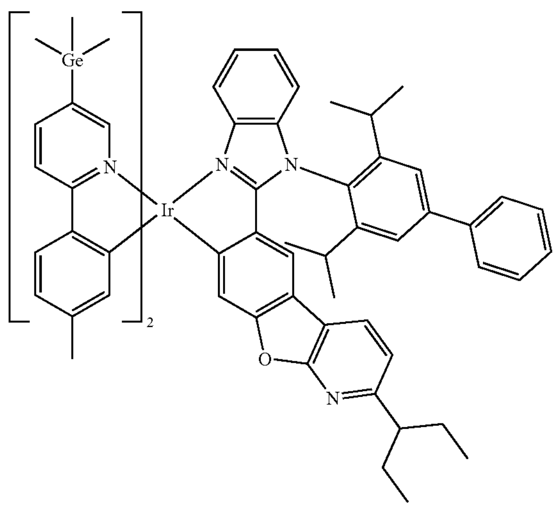

-continued
2066
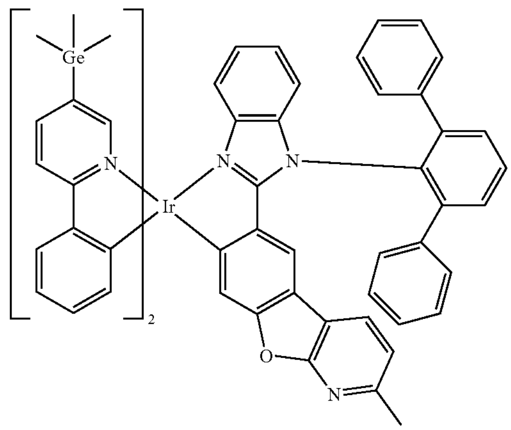
2067
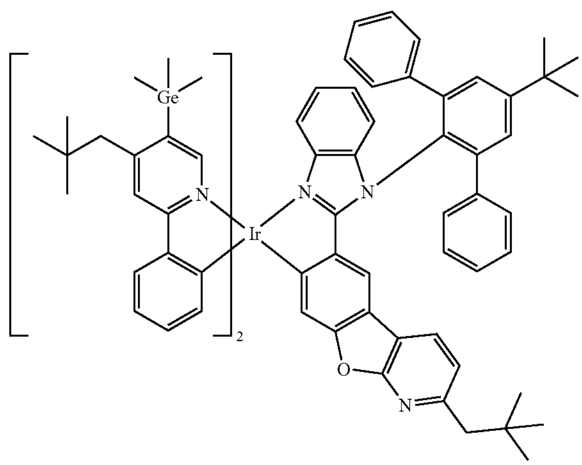
2068
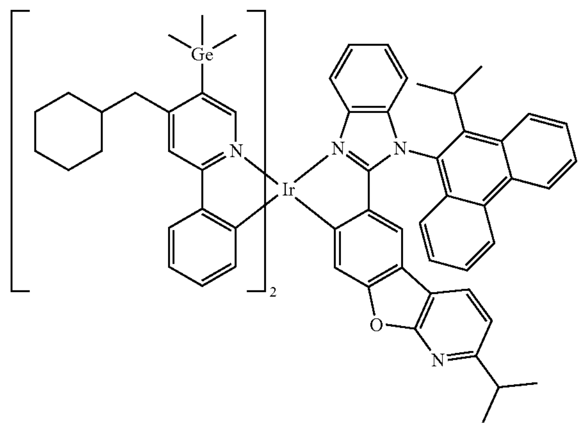

-continued
2069
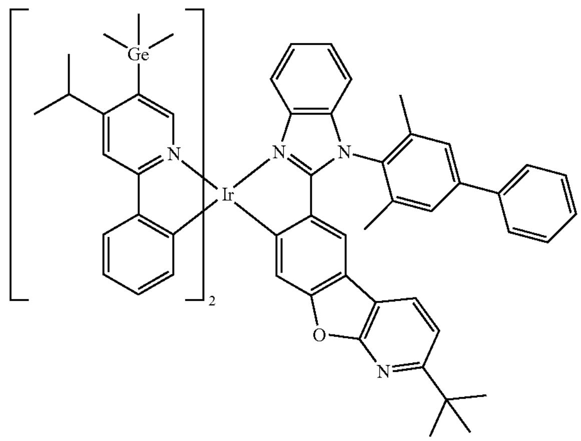
2070
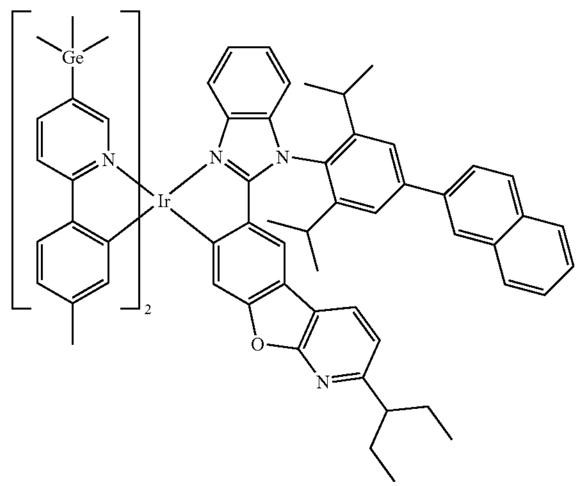
2071
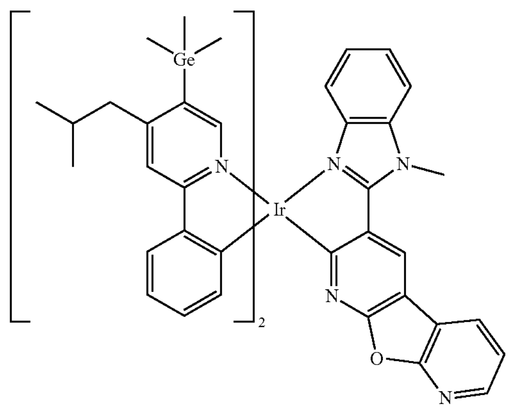

-continued
2072
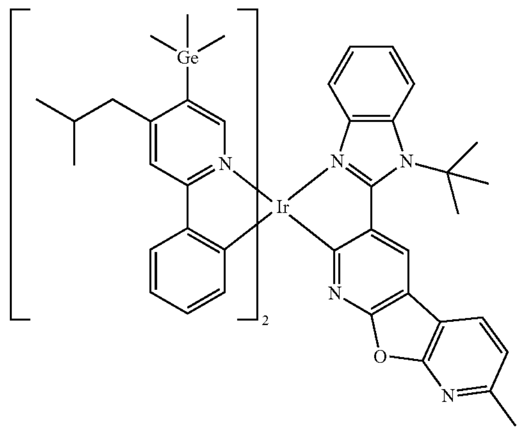
2073
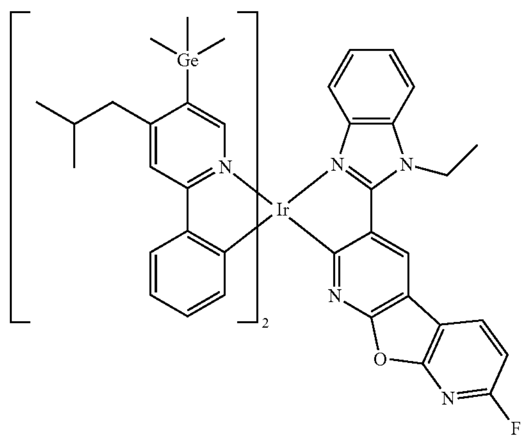
2074
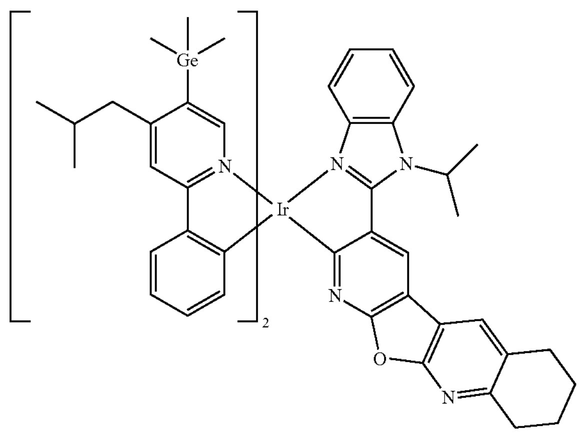

-continued
2075
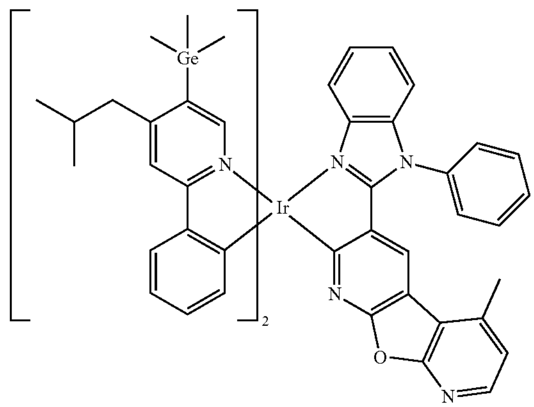
2076
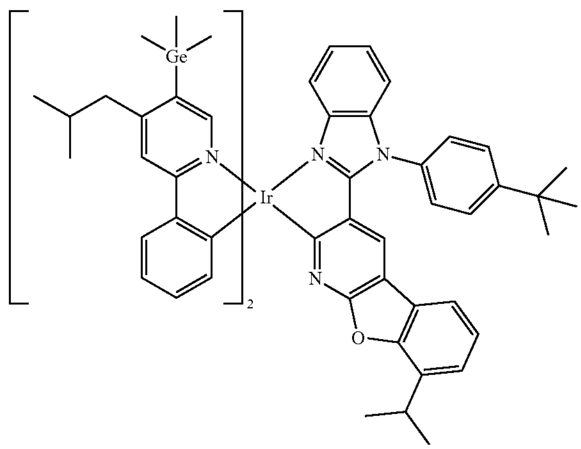
2077
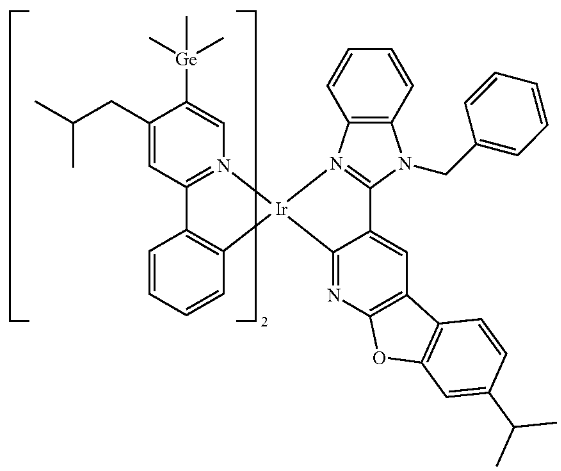

-continued
2078
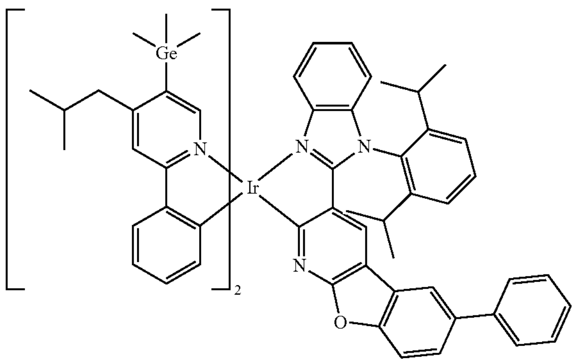
2079
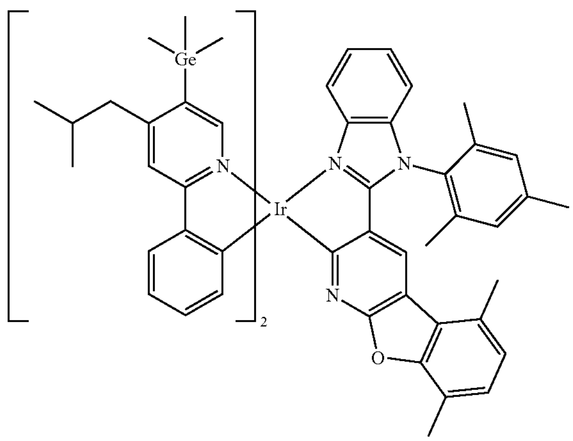
2080
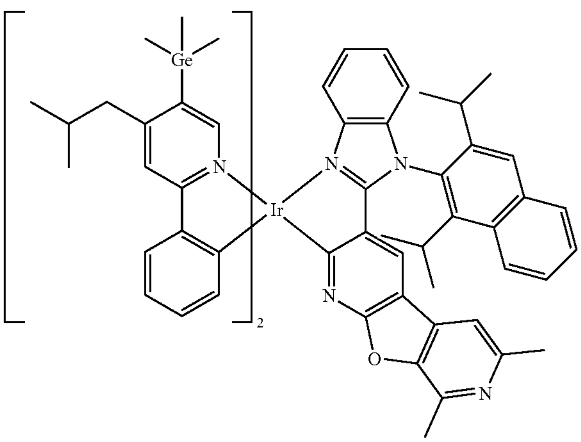

-continued
2081
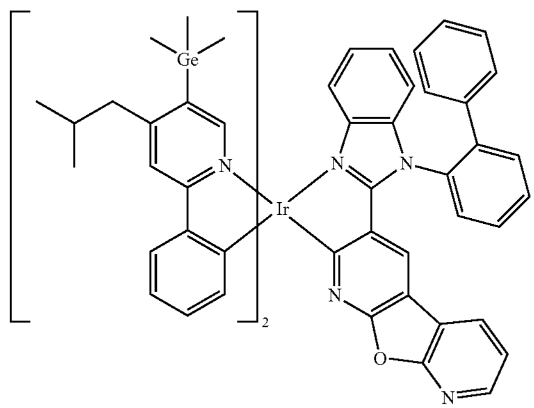
2082
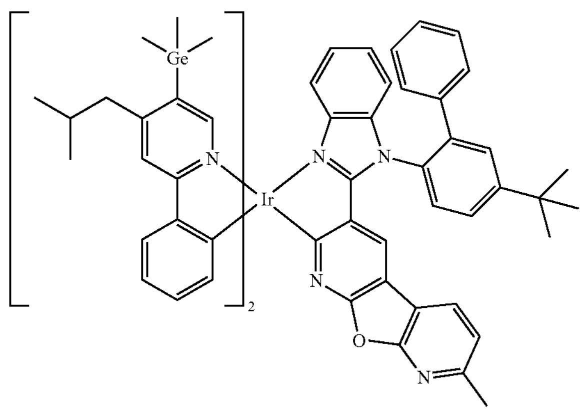
2083
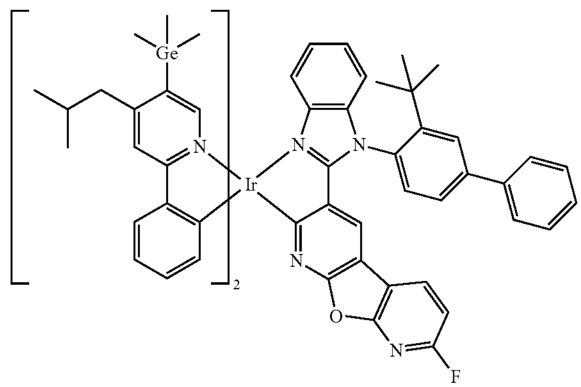
2084
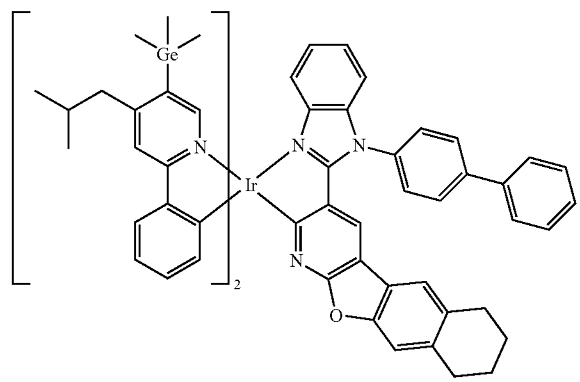

-continued
2085
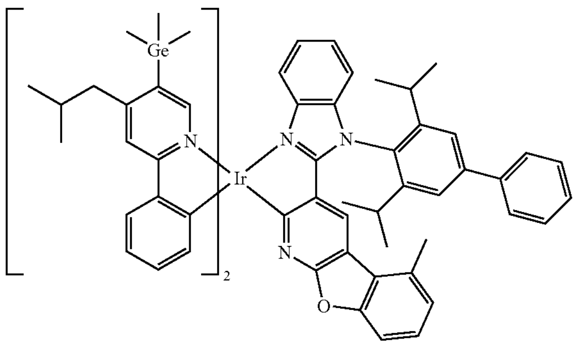
2086
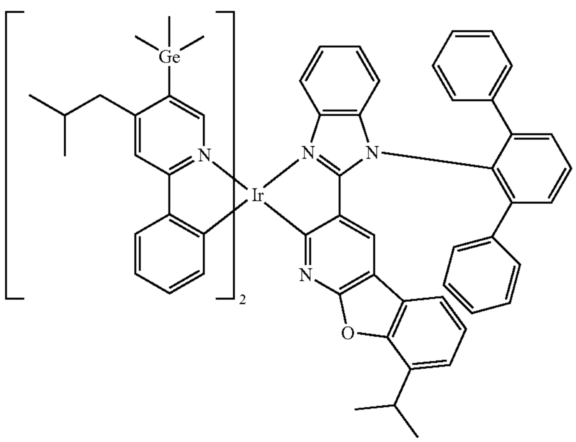
2087
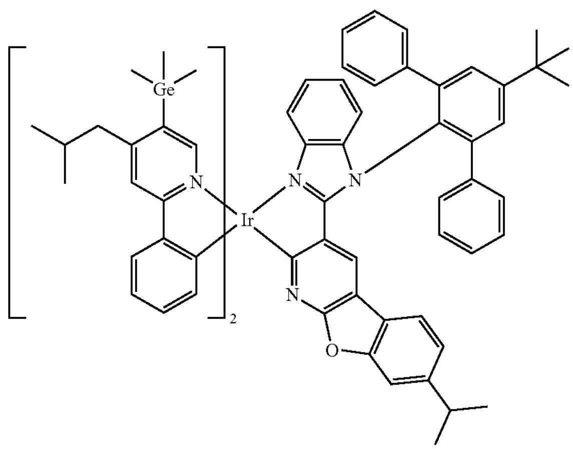

-continued
2088
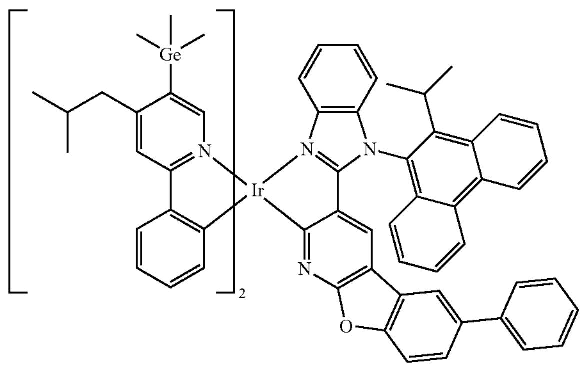
2089
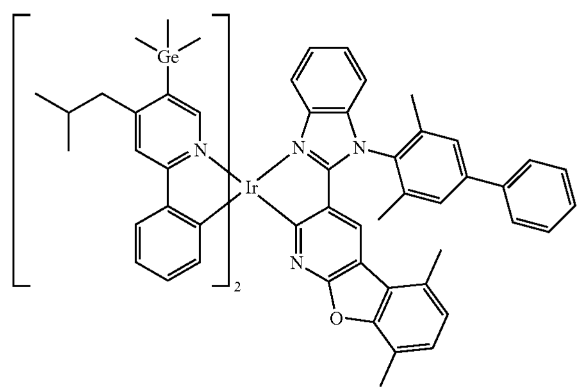
2090
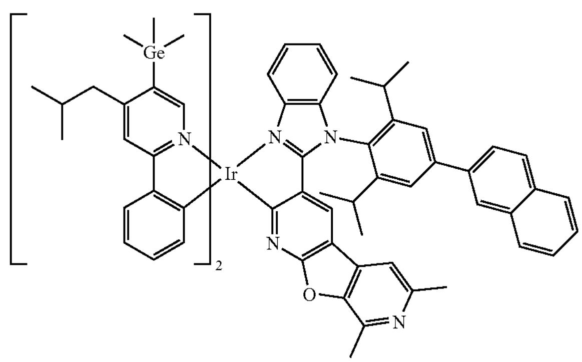
2091
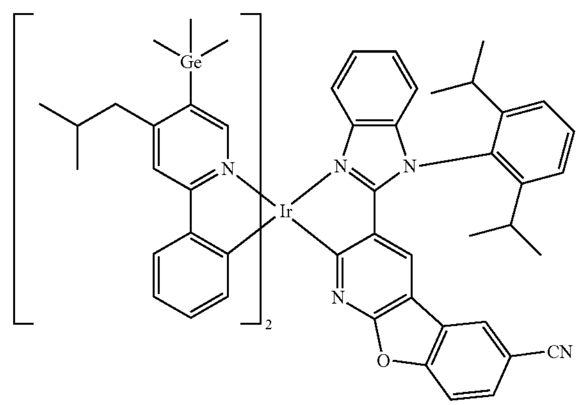

-continued
2092
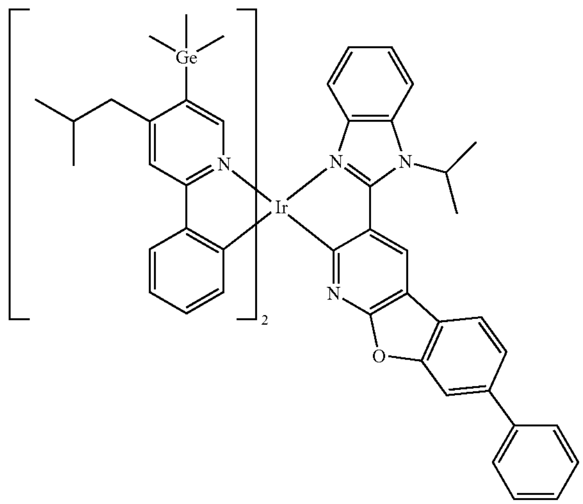
2093
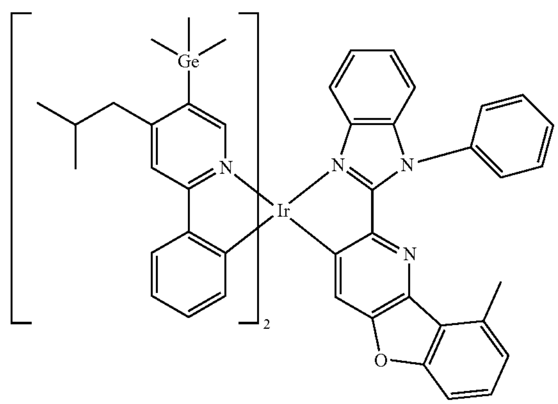
2094
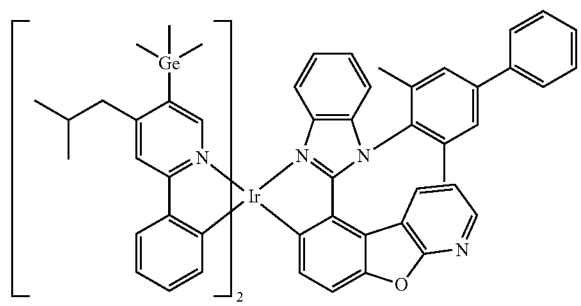
2095
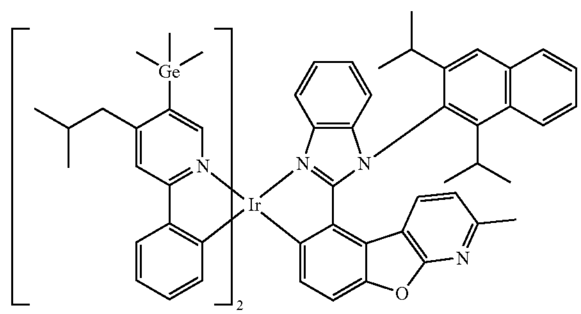

-continued
2096
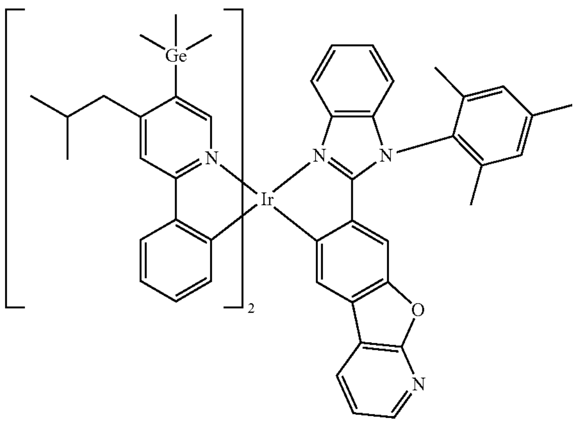
2097
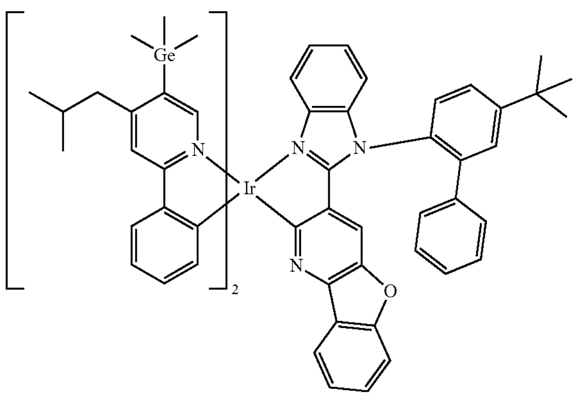
2098
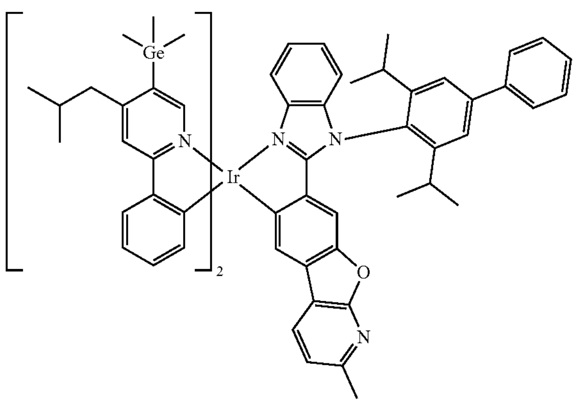

-continued
2099
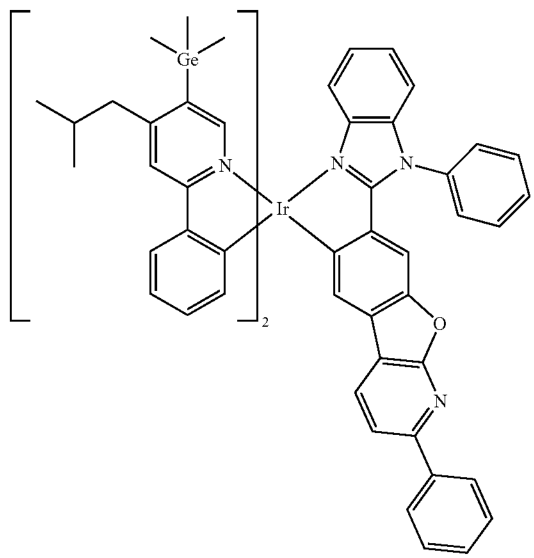
2100
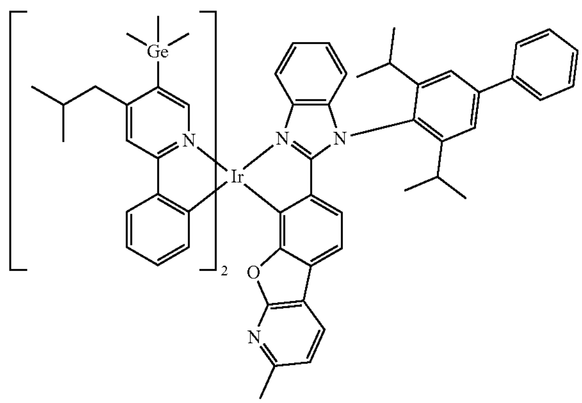
2101
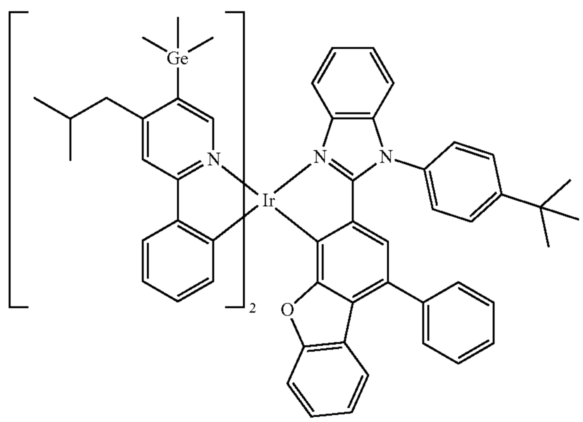

-continued
2102
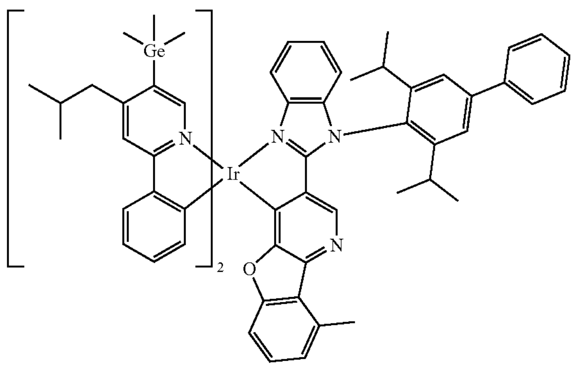
2103
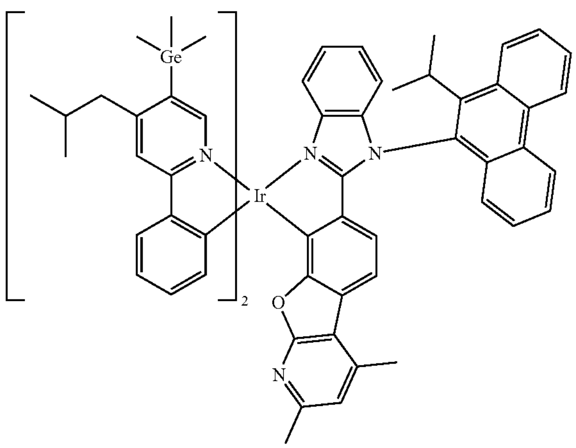
2104
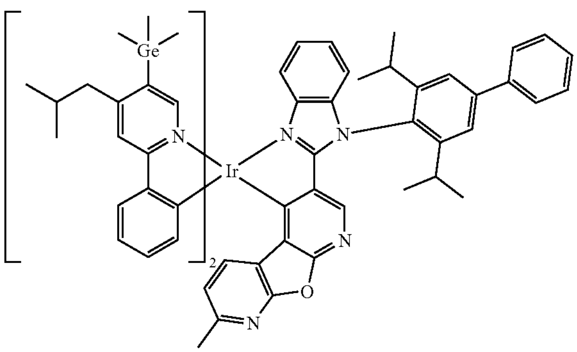
2105
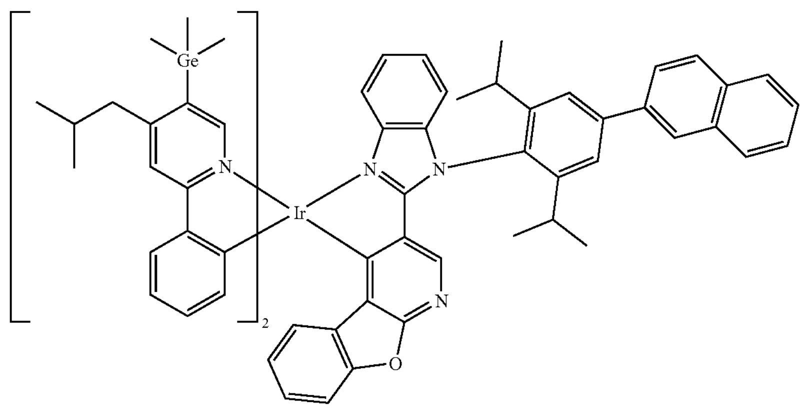

-continued
2106
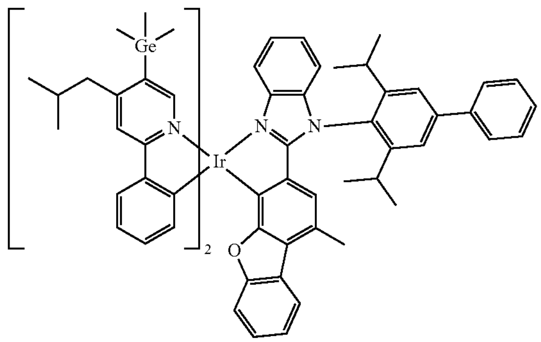
2107
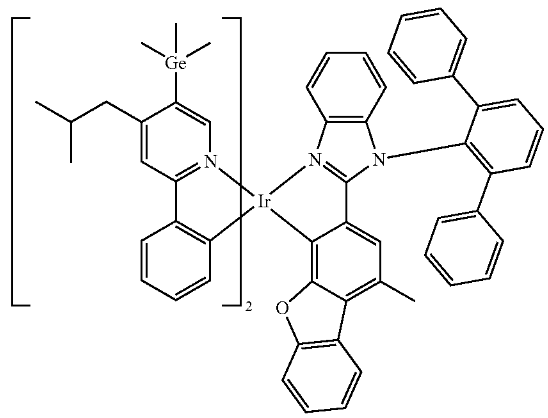
2108
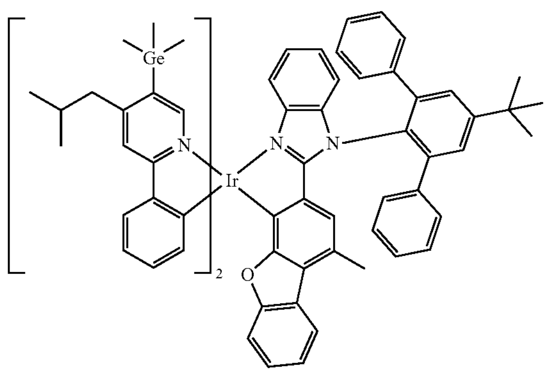
2109
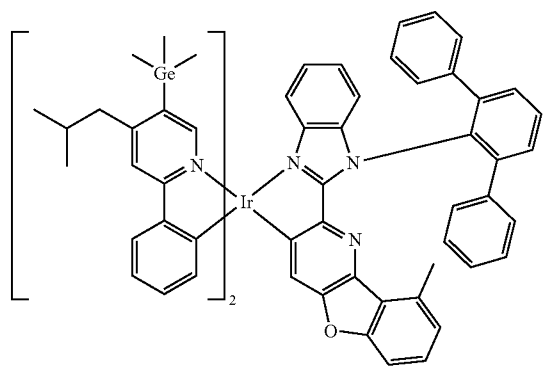
2110
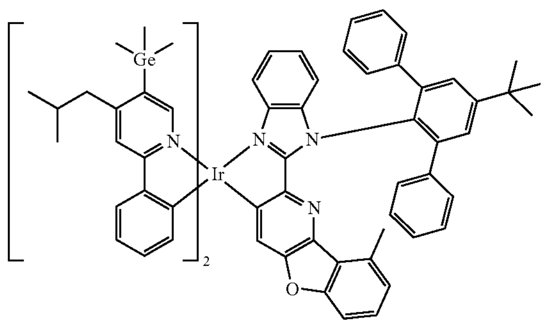
2111
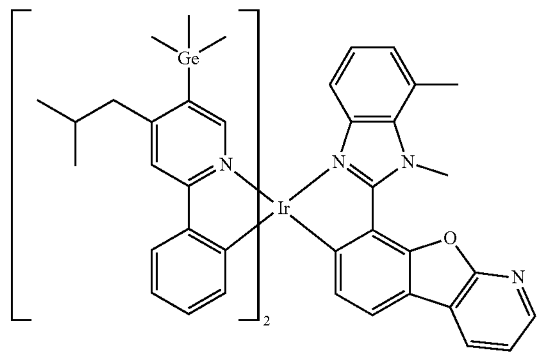
2112
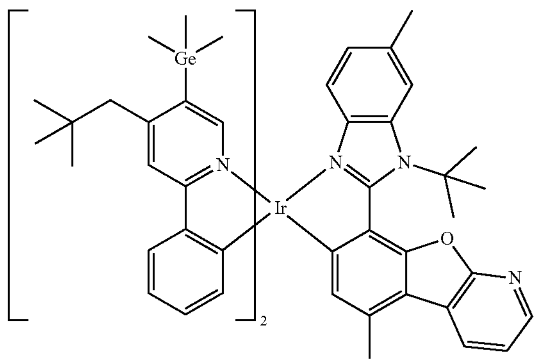

-continued
2113
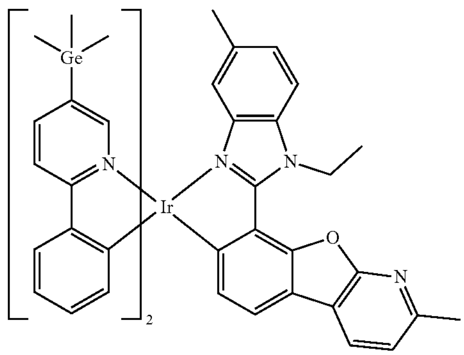
2114
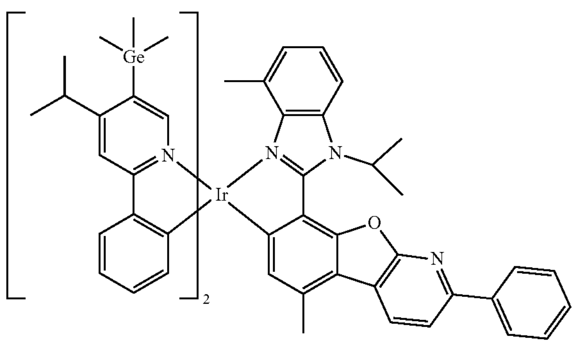
2115
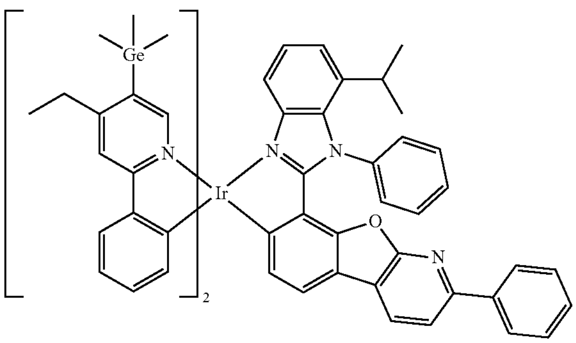
2116
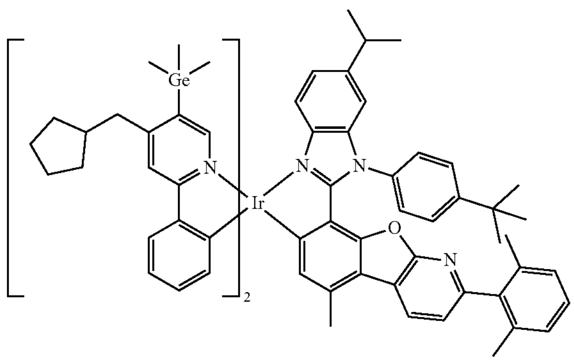

-continued
2117
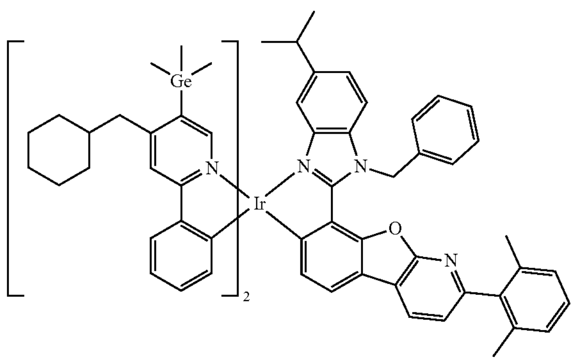
2118
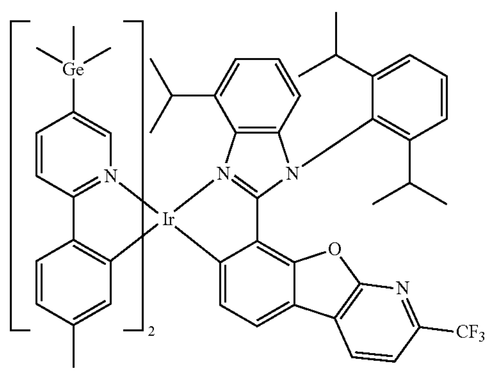
2119
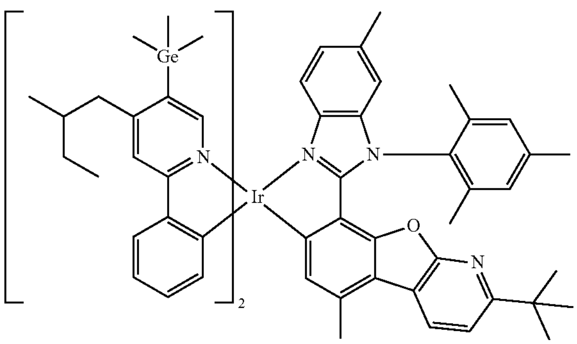
2120
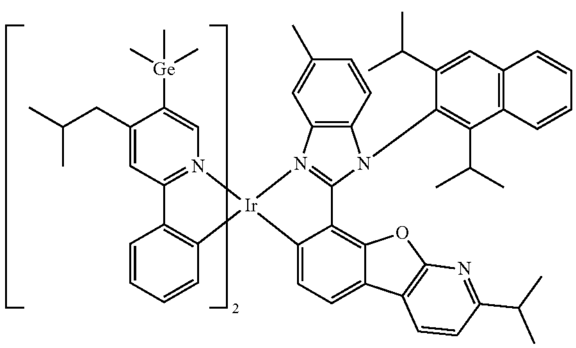

-continued
2121
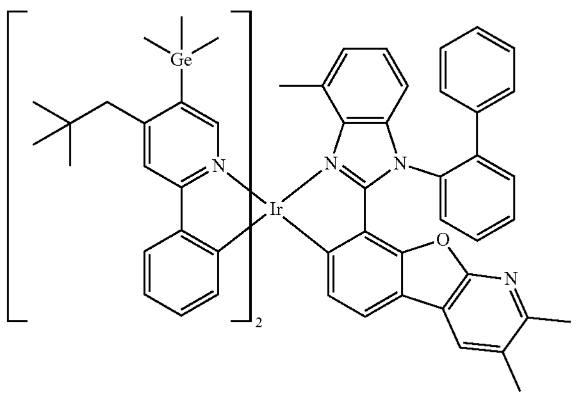
2122
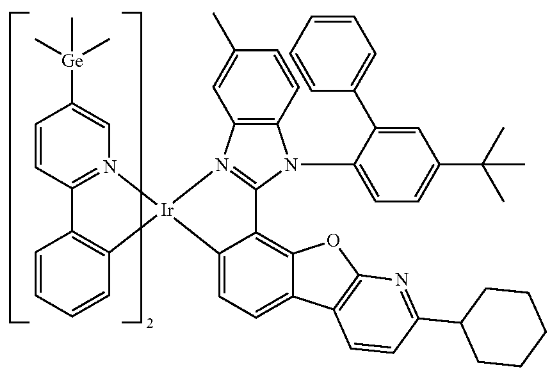
2123
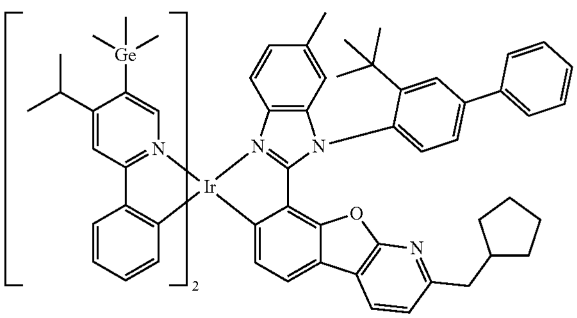
2124
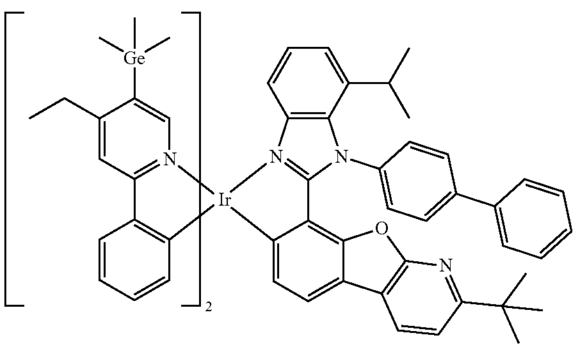

-continued
2125
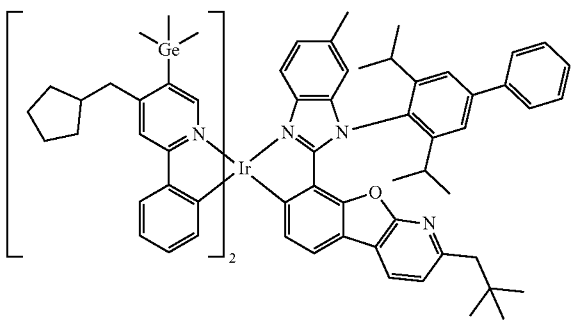
2126
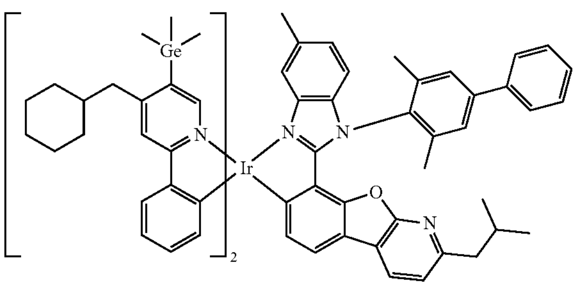
2127
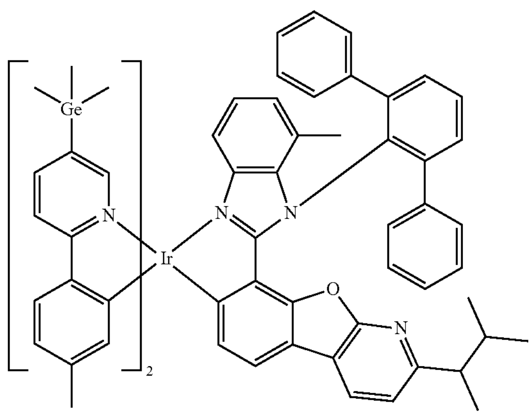
2128
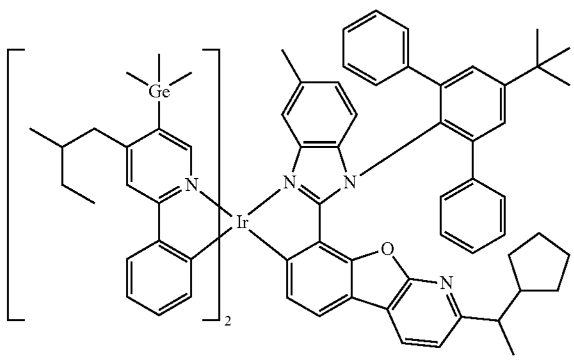

-continued
2129
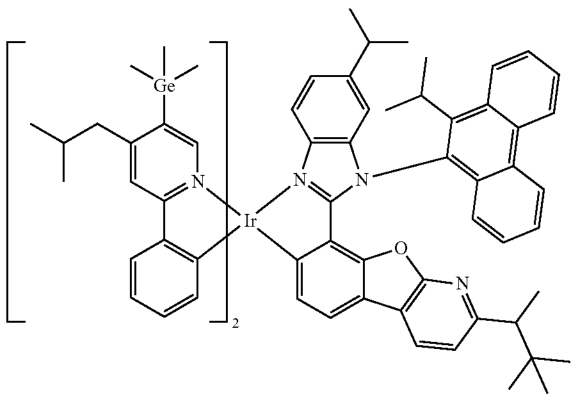
2130
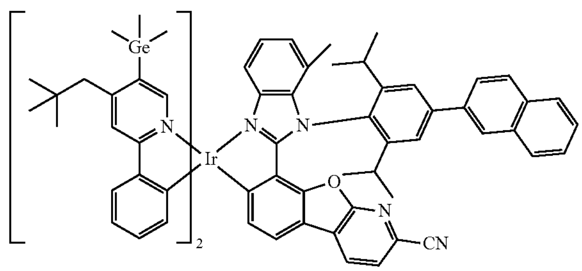
2131
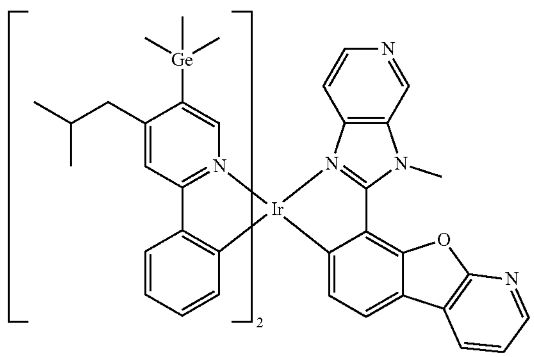
2132
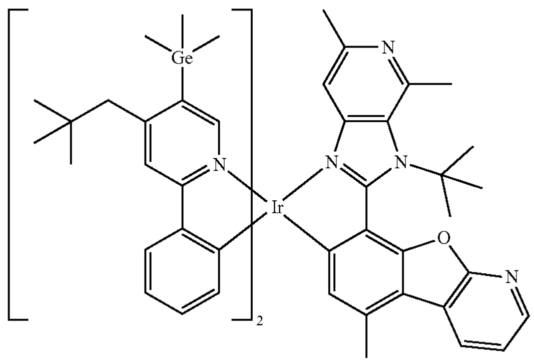

-continued
2133
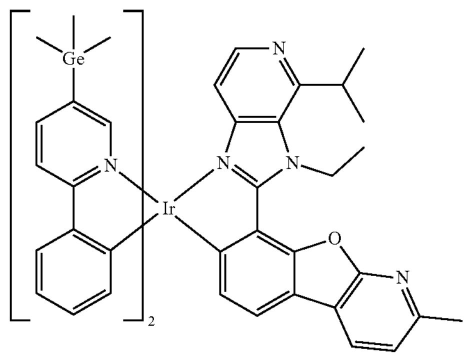
2134
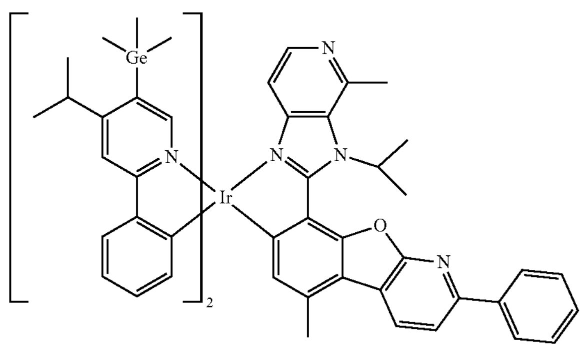
2135
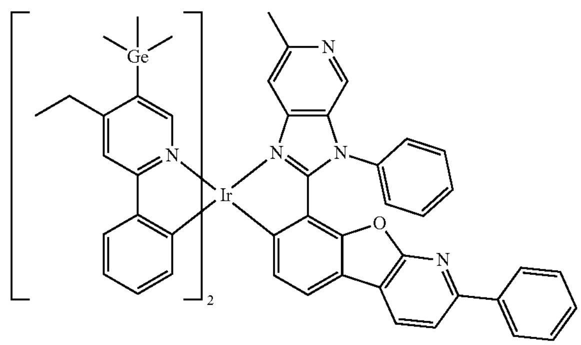
2136
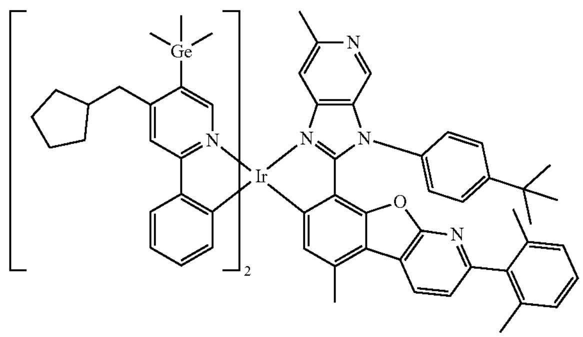

-continued
2137
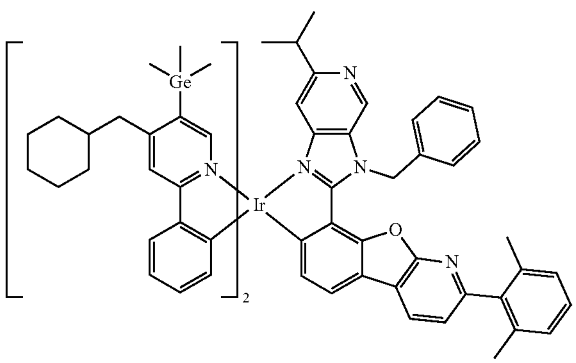
2138
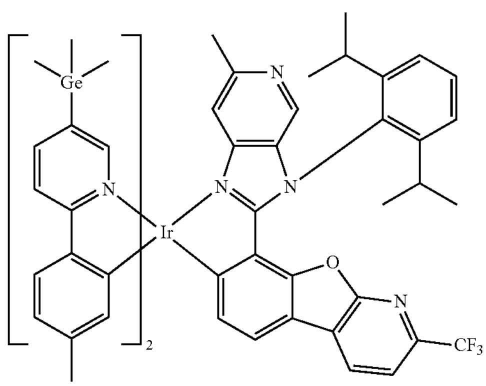
2139
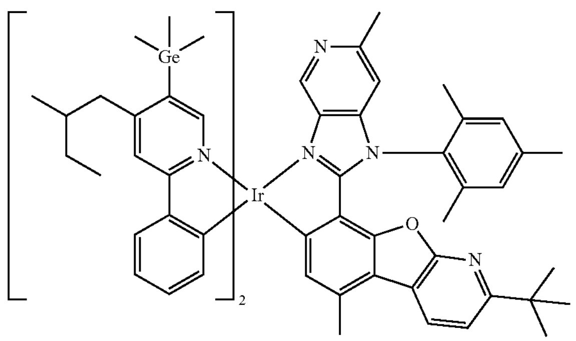
2140
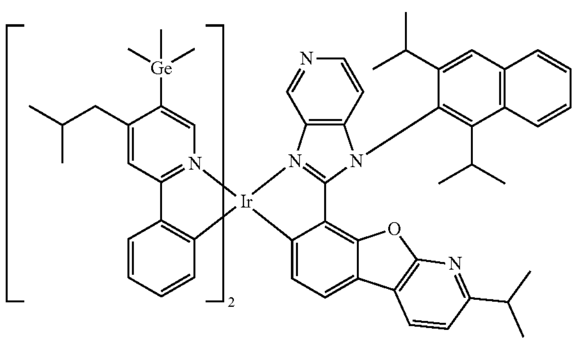

-continued
2141
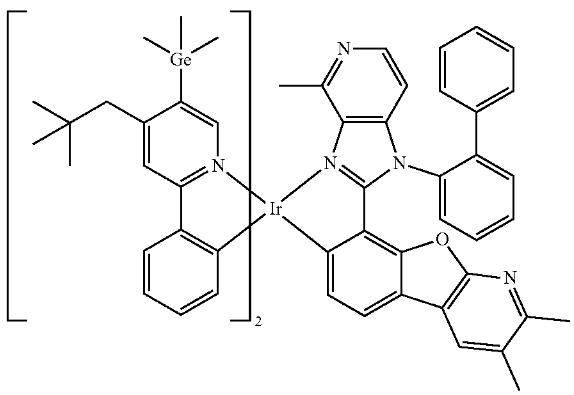
2142
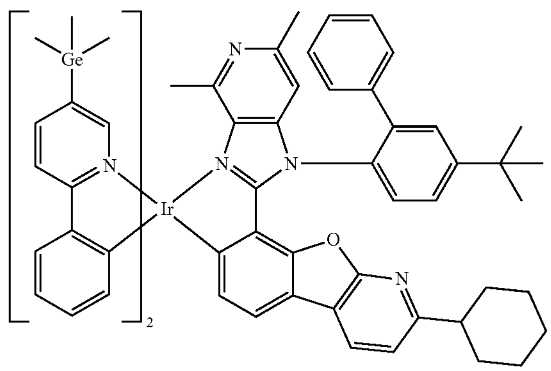
2143
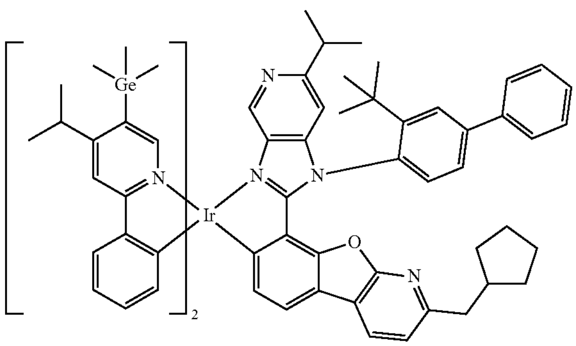
2144
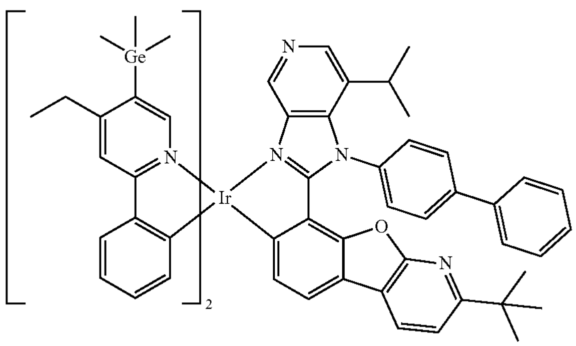

-continued
2145
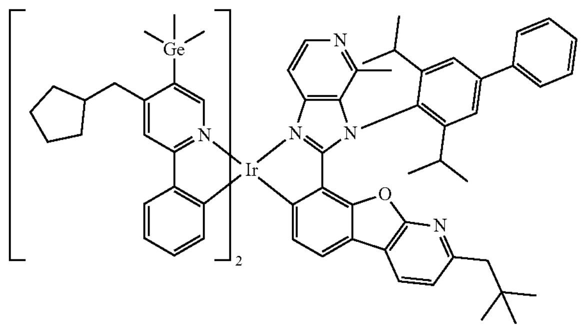
2146
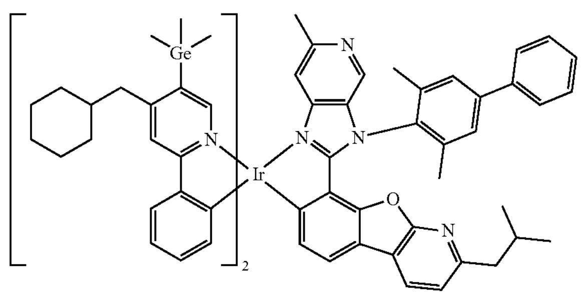
2147
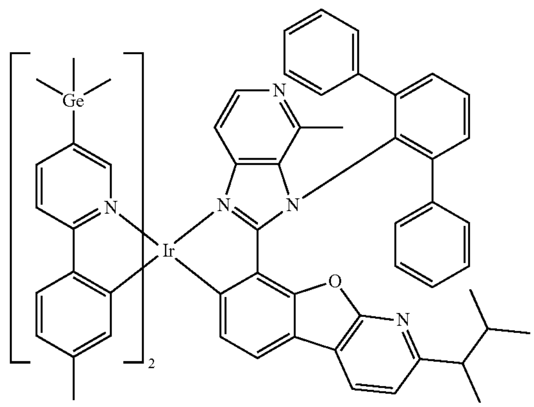
2148
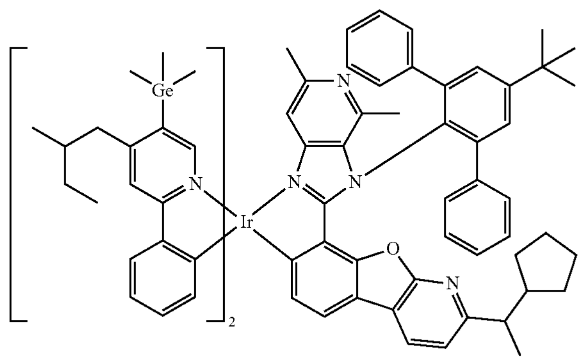

-continued
2149
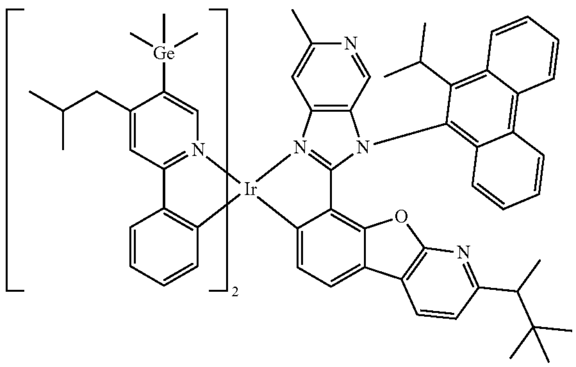
2150
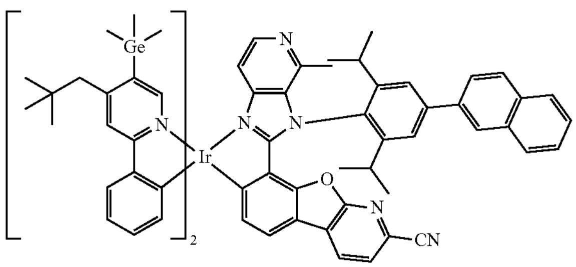
2151
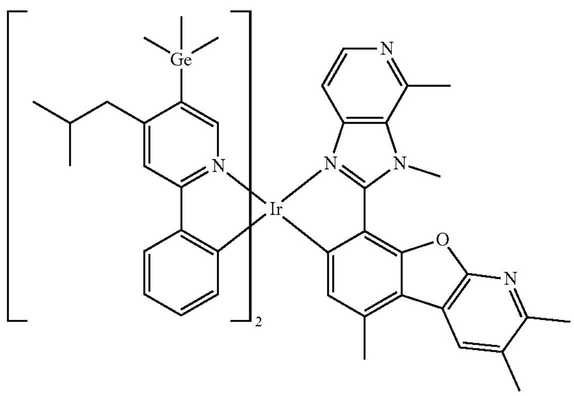
2152
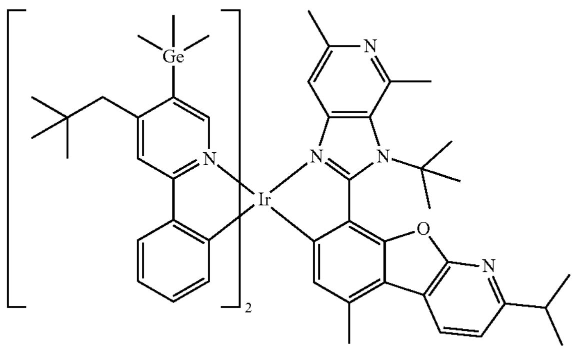

-continued
2153
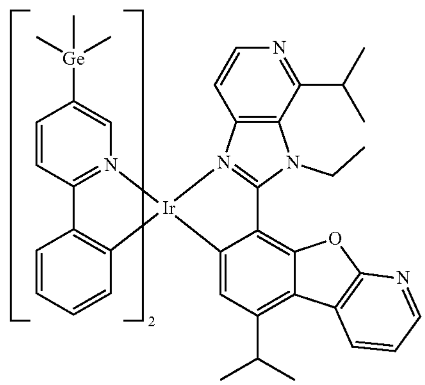
2154
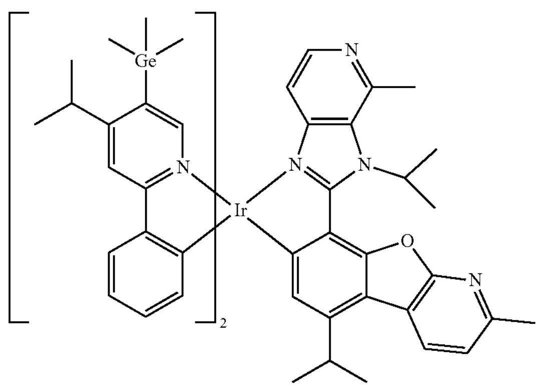
2155
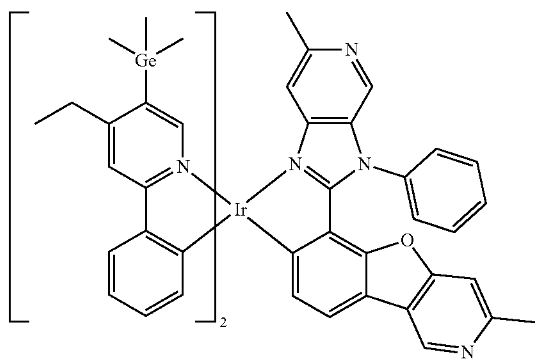
2156
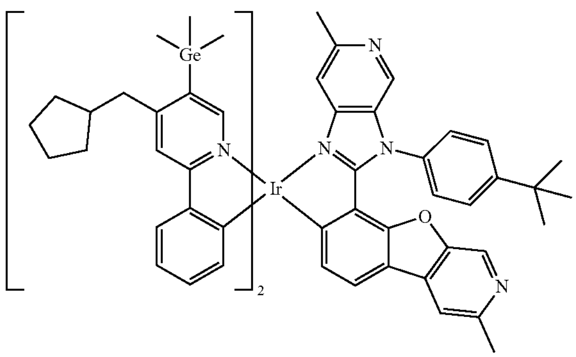

-continued
2157
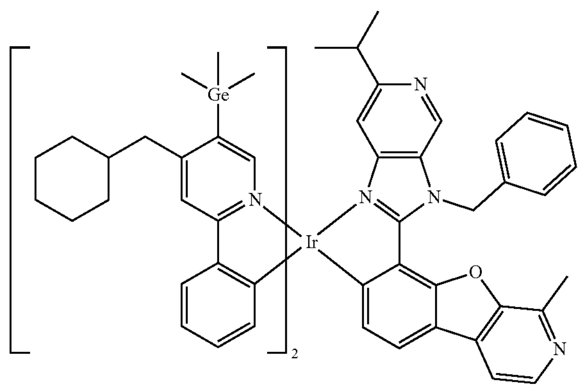
2158
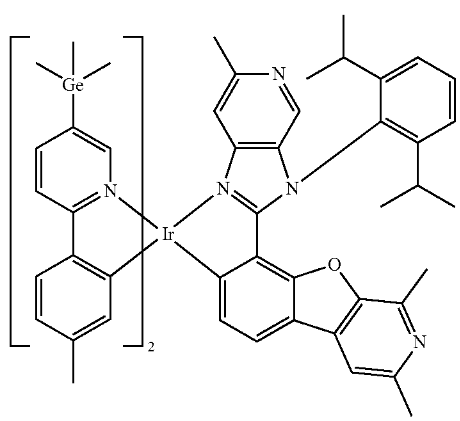
2159
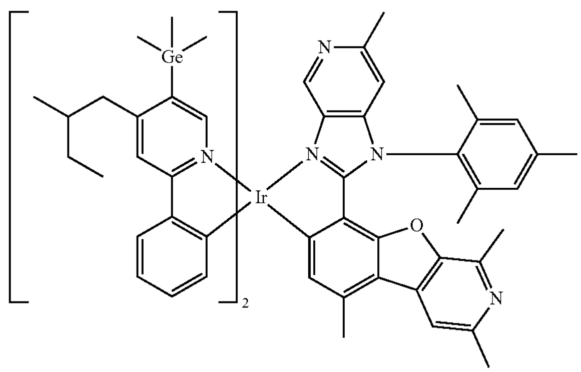
2160
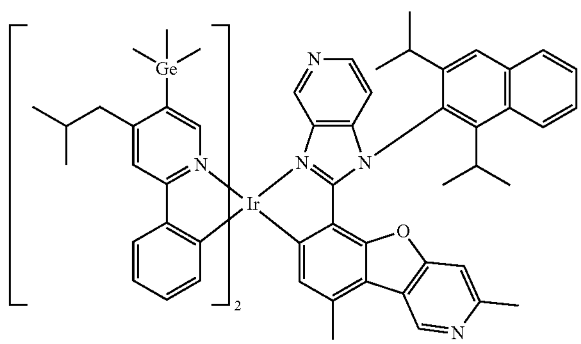

-continued
2161
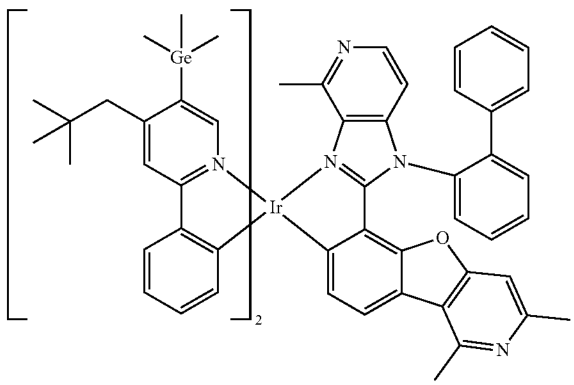
2162
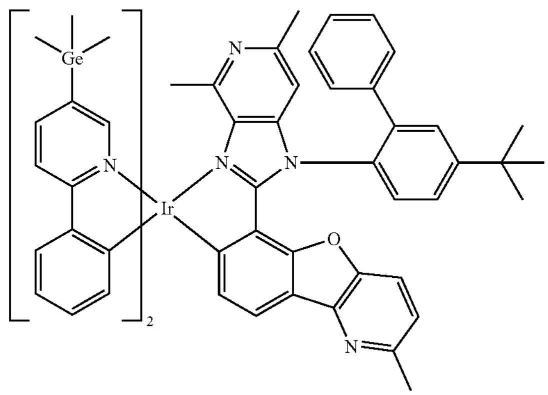
2163
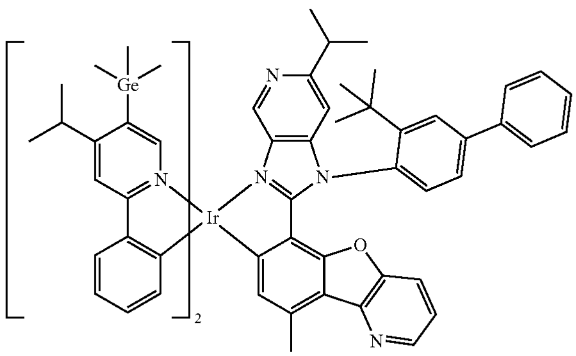
2164
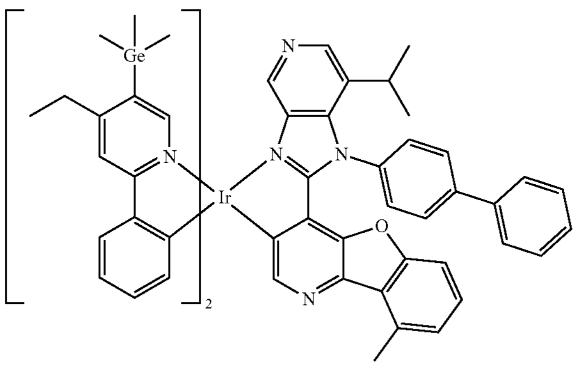

-continued
2165
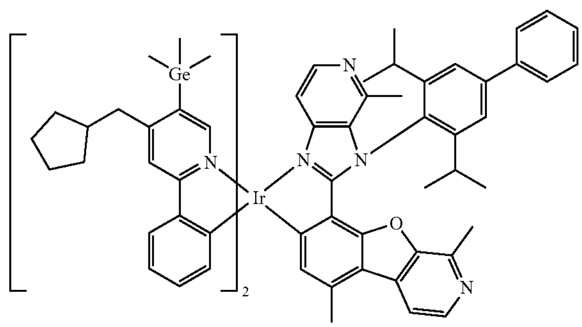
2166
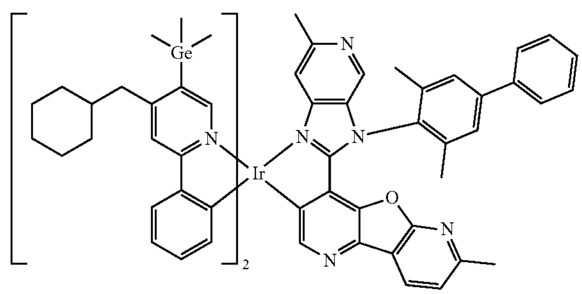
2167
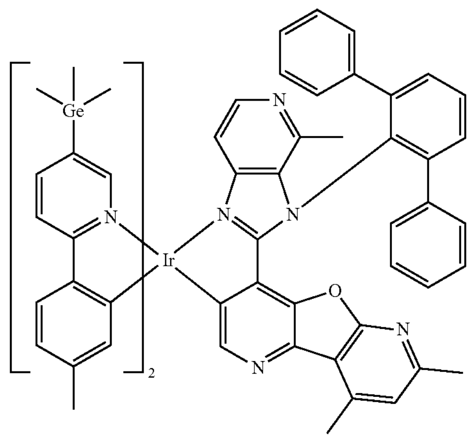
2168
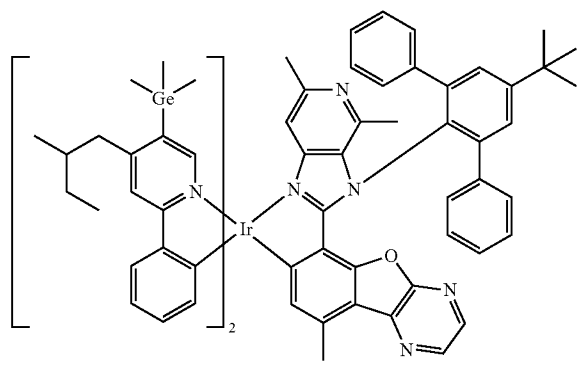

-continued
2169
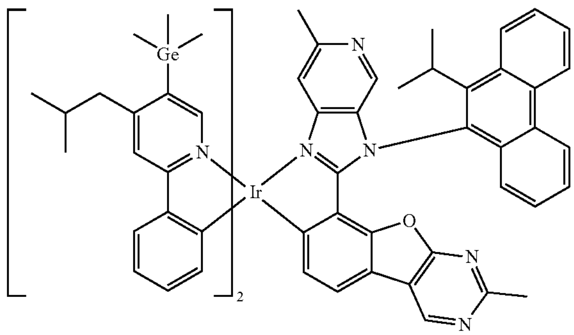
2170
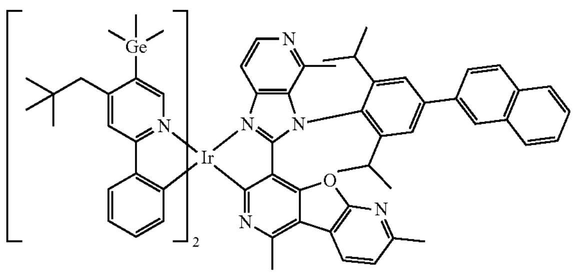
2171
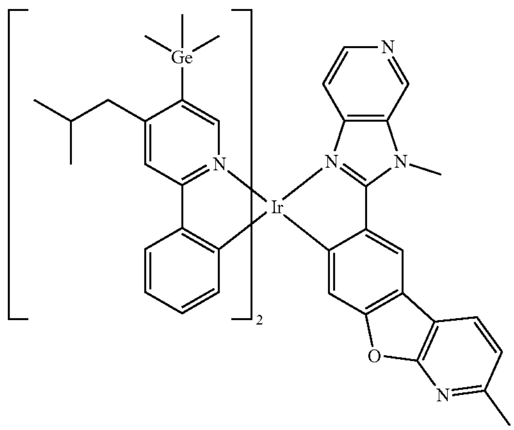
2172
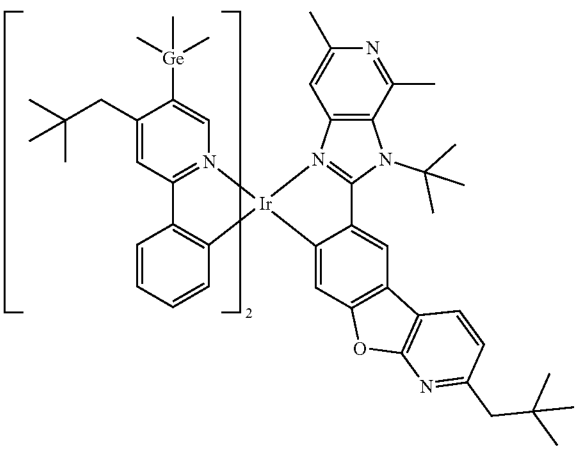

-continued
2173
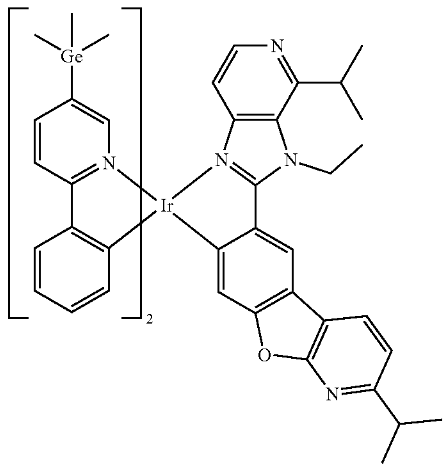
2174
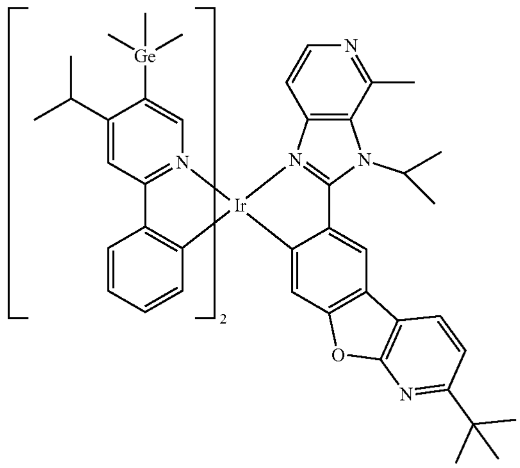
2175
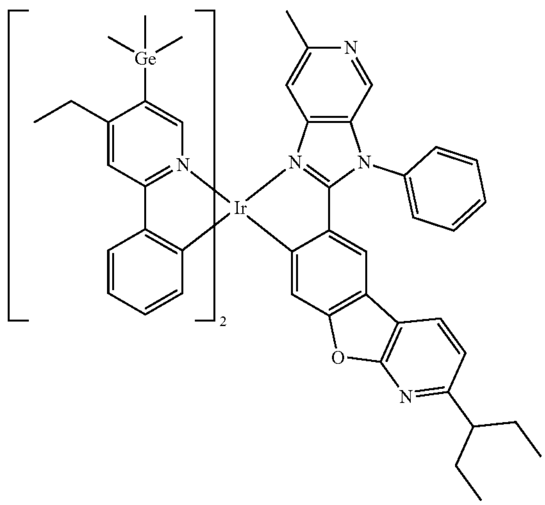

-continued
2176
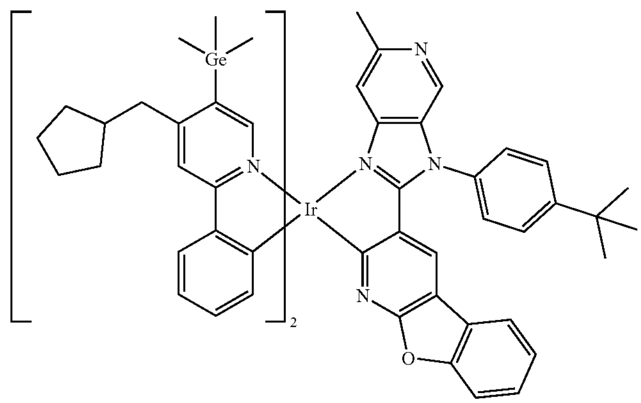
2177
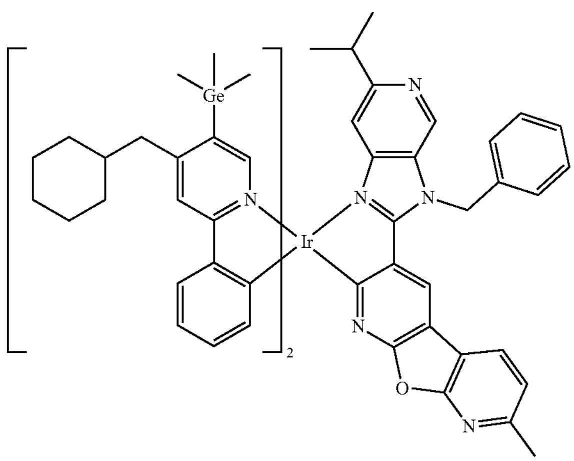
2178
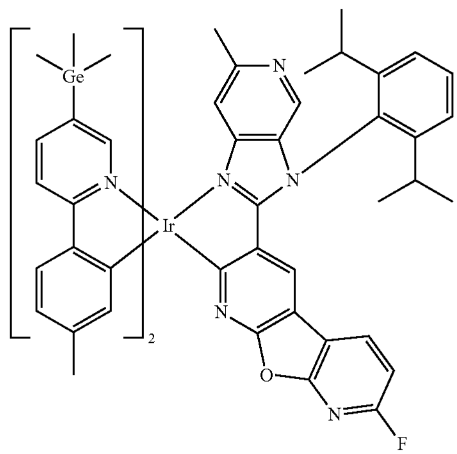

-continued
2179
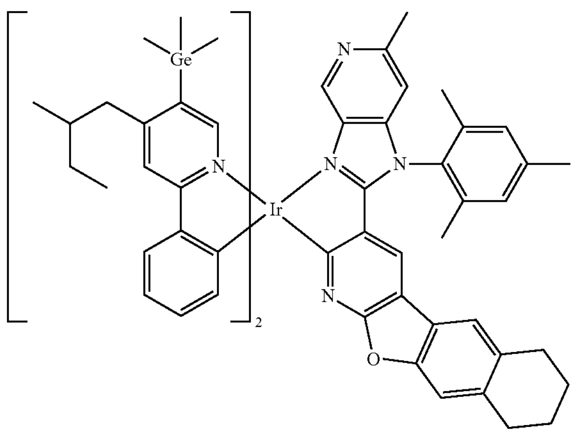
2180
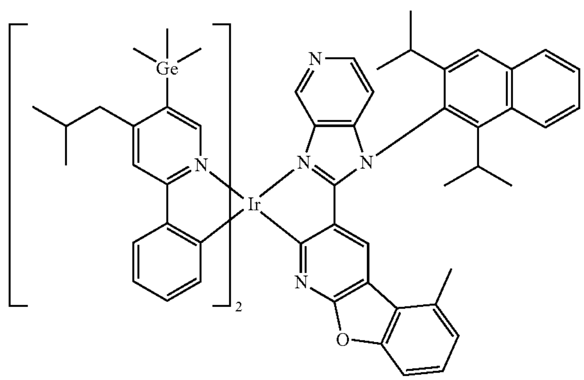
2181
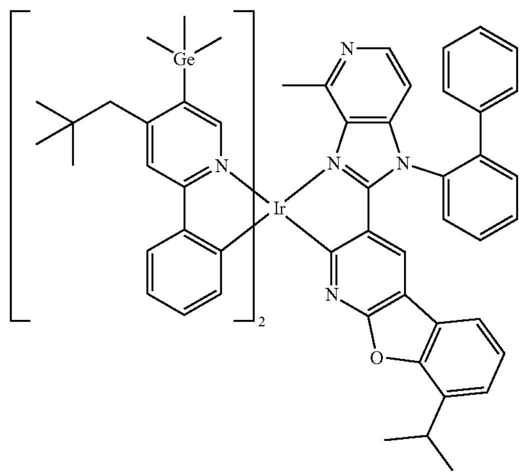

-continued
2182
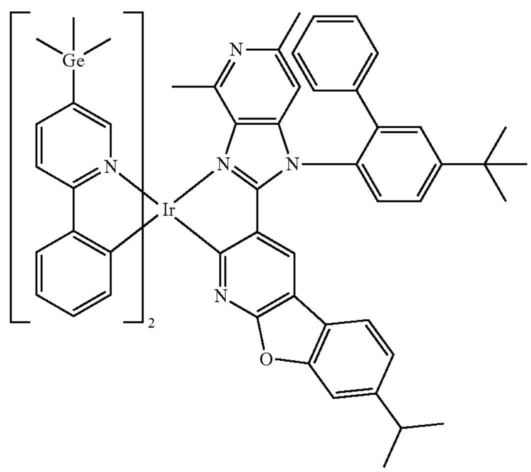
2183
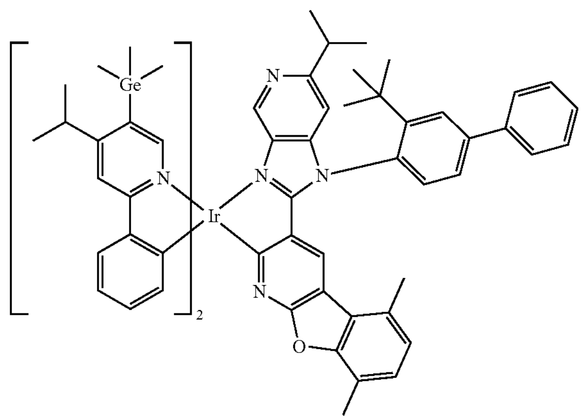
2184
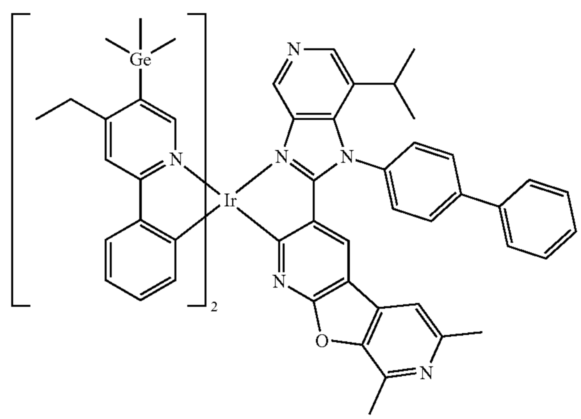

-continued
2185
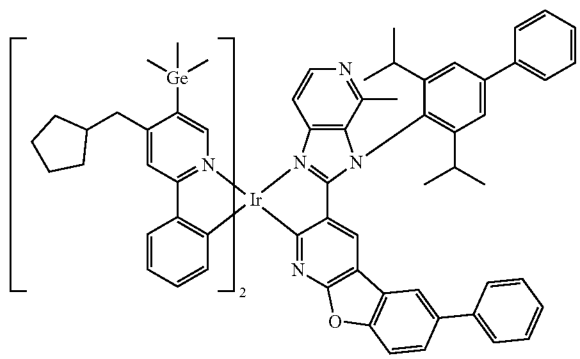
2186
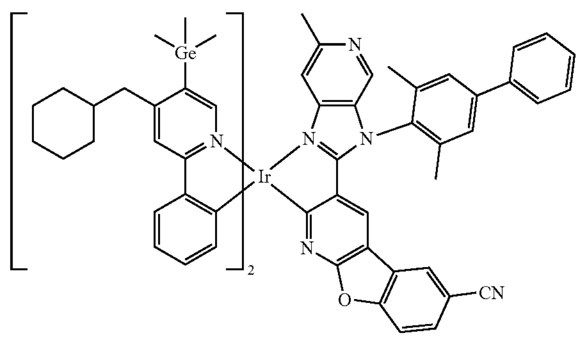
2187
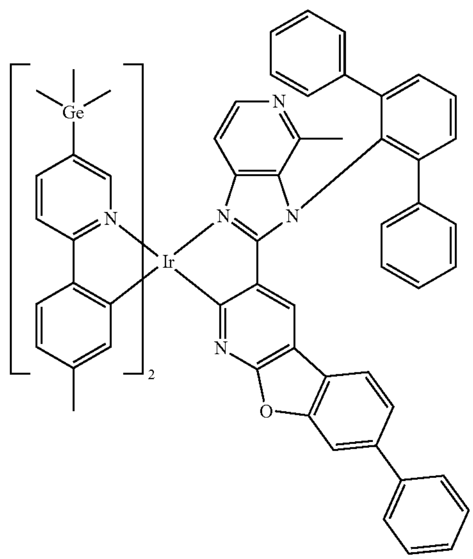

-continued
2188
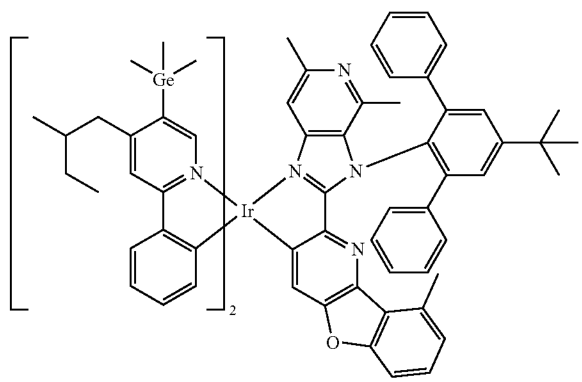
2189
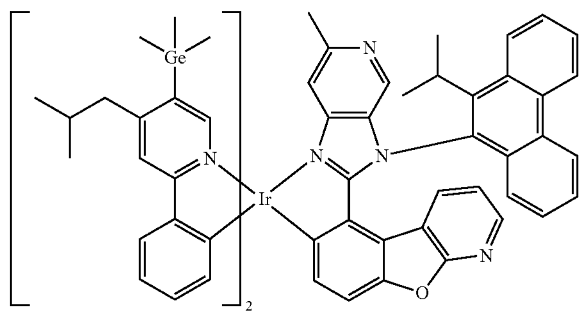
2190
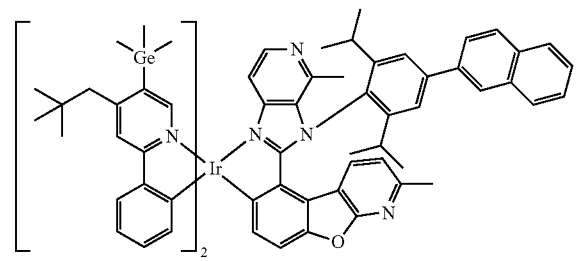
2191
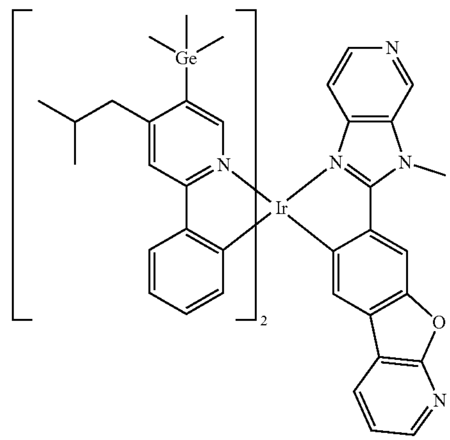

-continued
2192
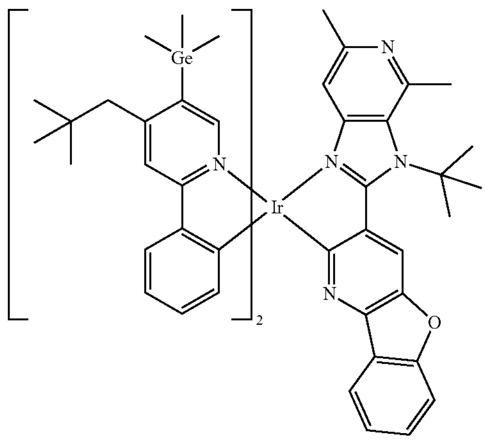
2193
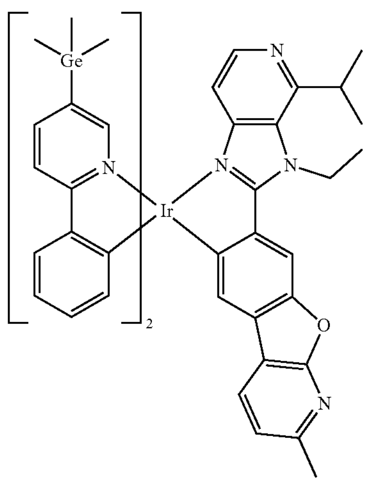
2194
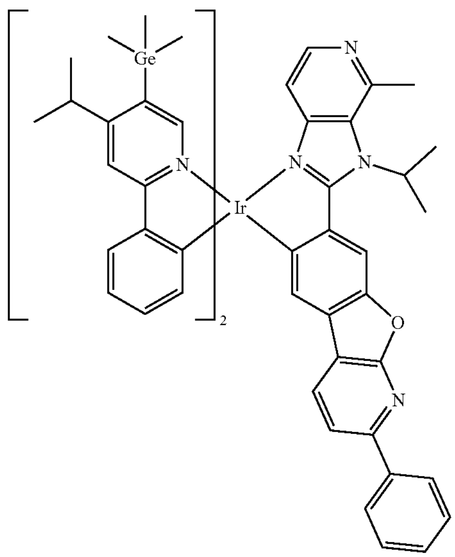

-continued
2195
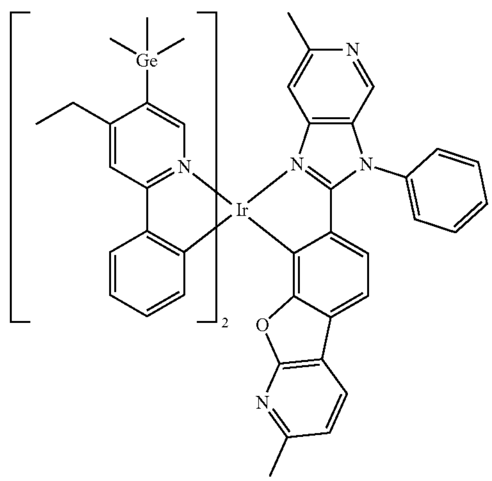
2196
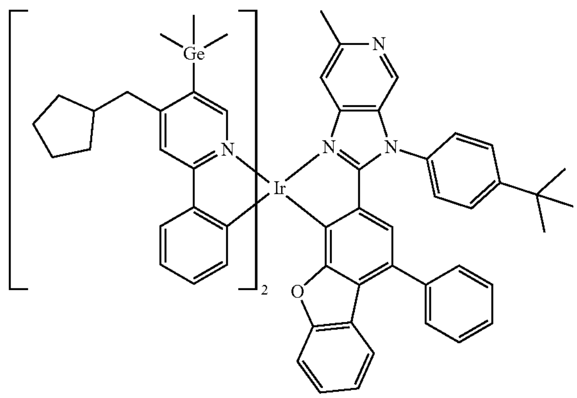
2197
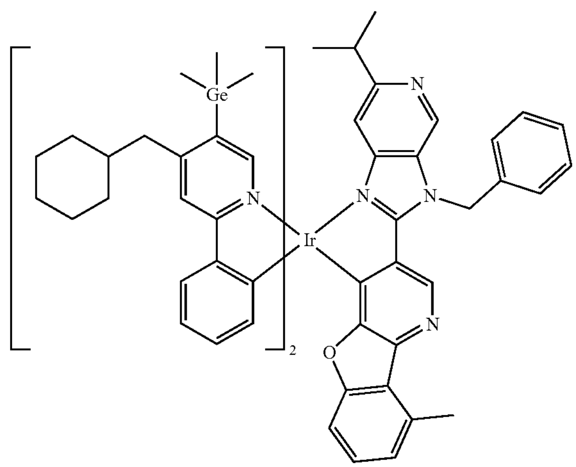

-continued
2198
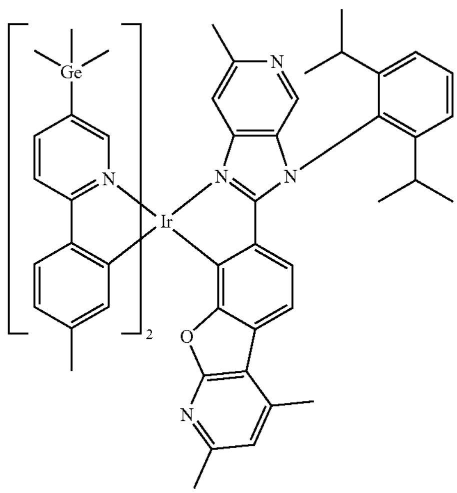
2199
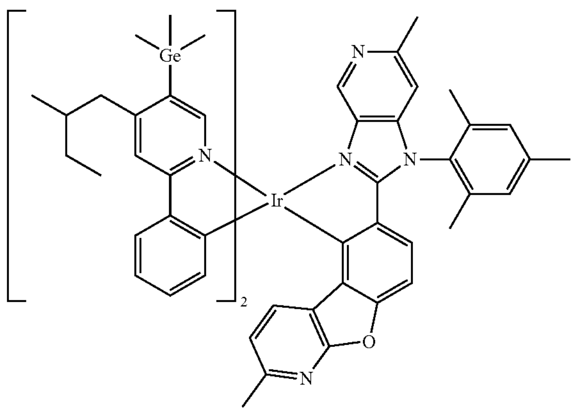
2200
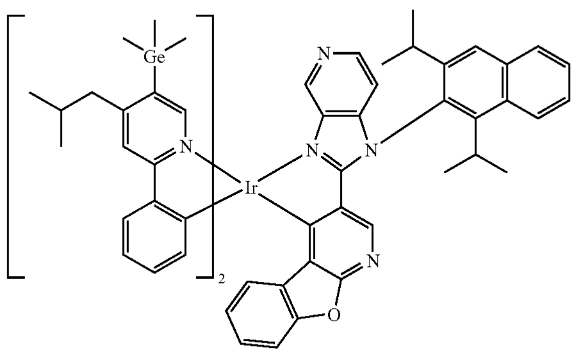

-continued
2201
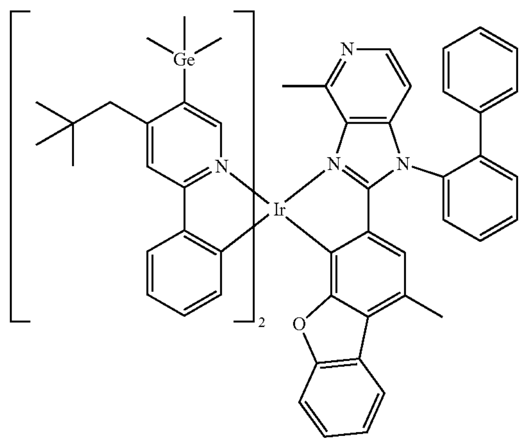
2202
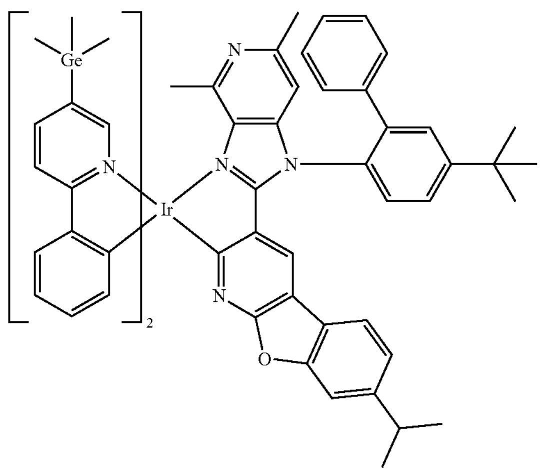
2203
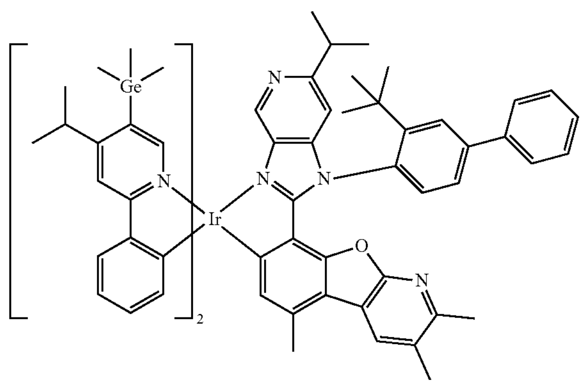

-continued
2204
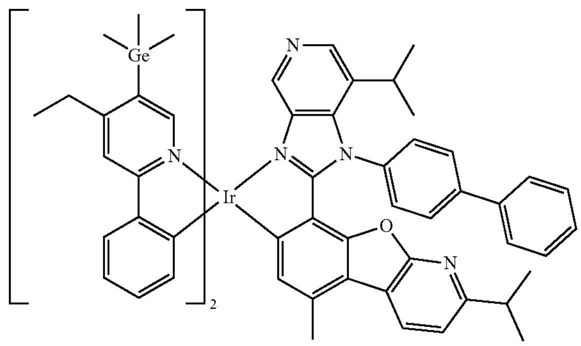
2205
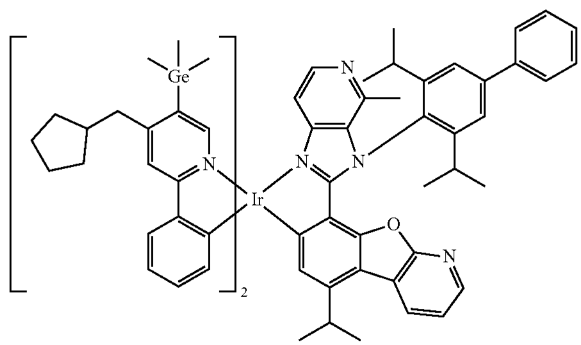
2206
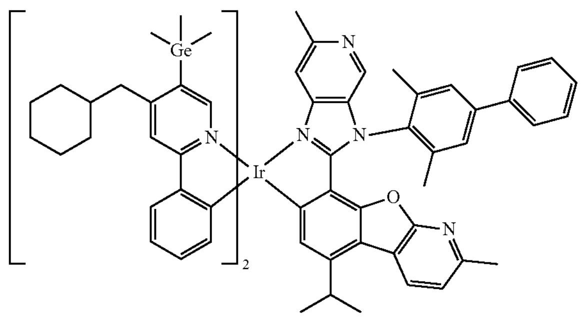
2207
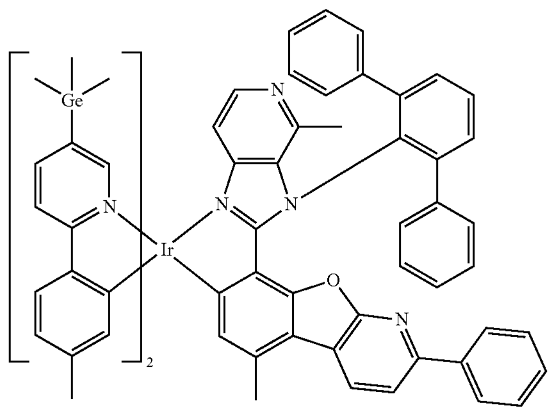

-continued
2208
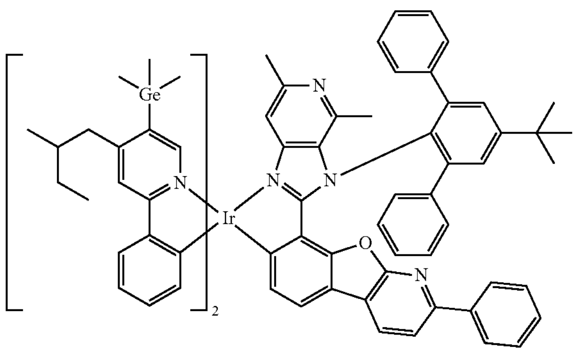
2209
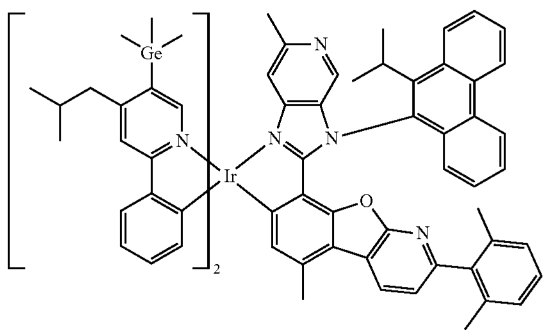
2210
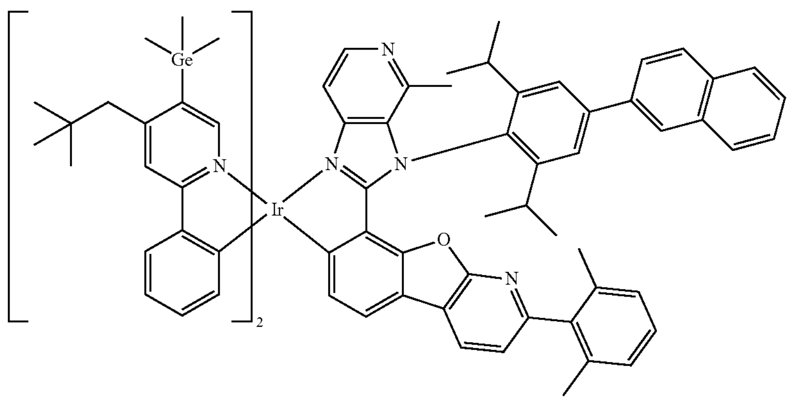
2211
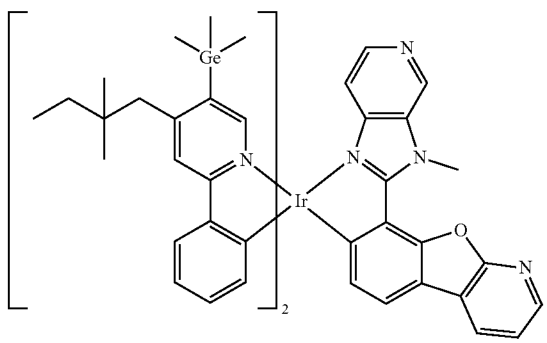
2212
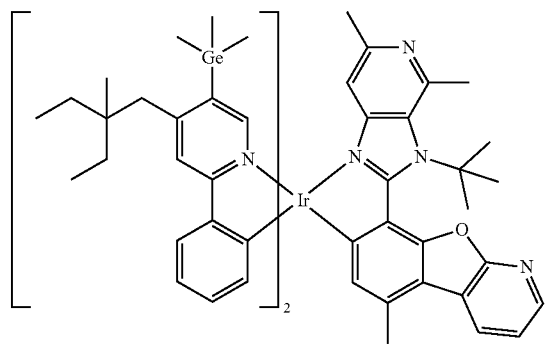

-continued
2213
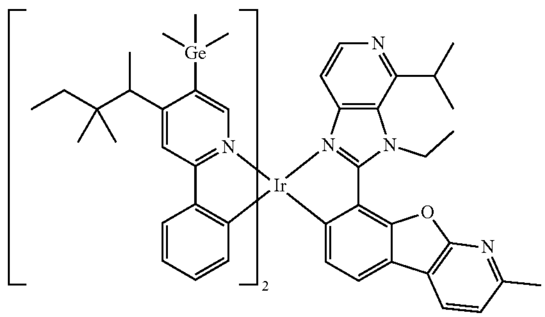
2214
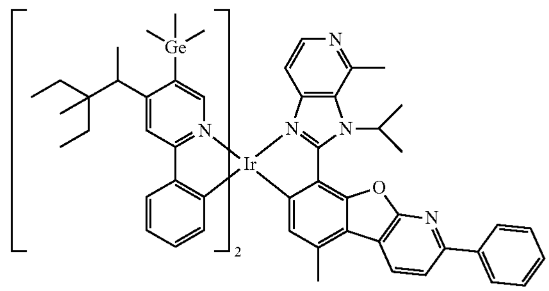
2215
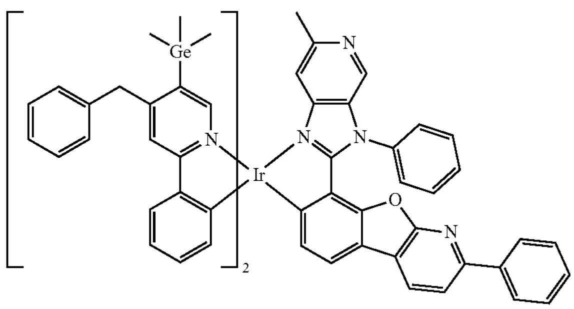
2216
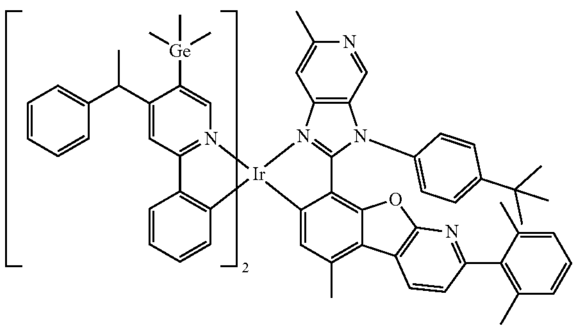
2217
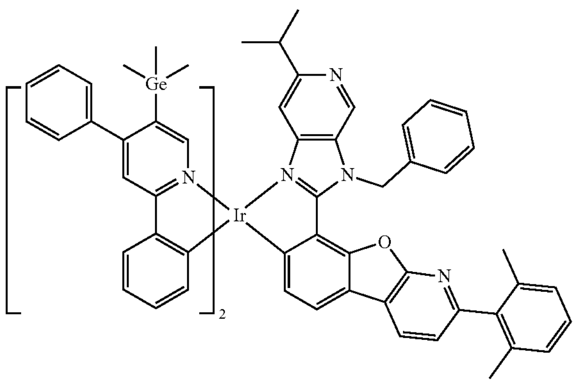

-continued
2218
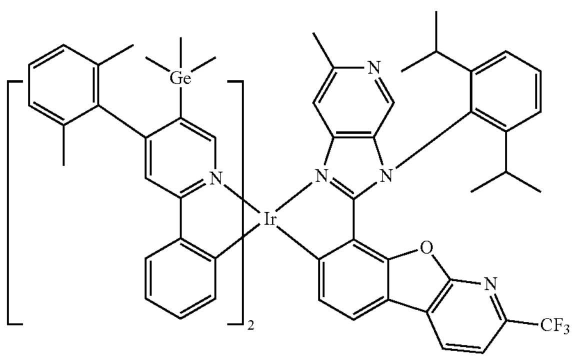
2219
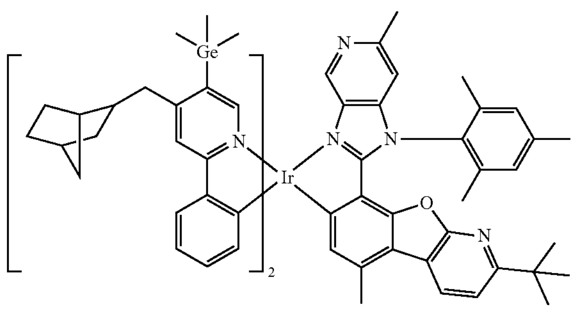
2220
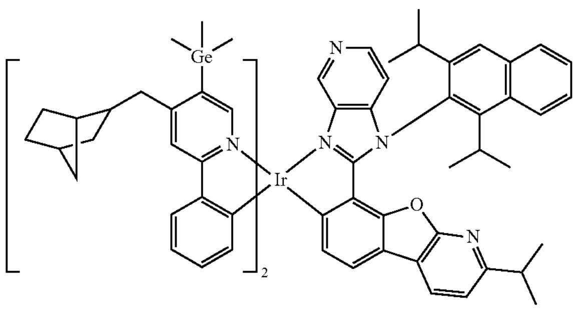
2221
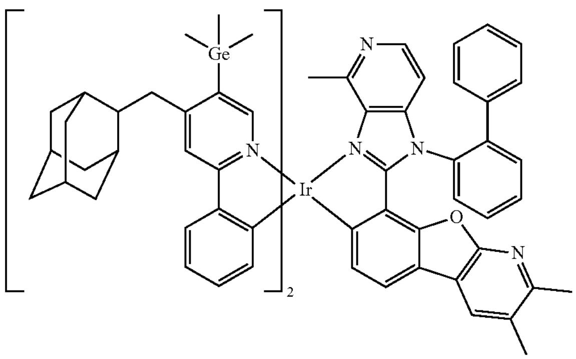

-continued
2222
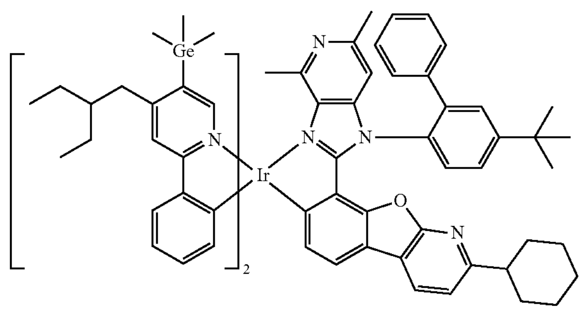
2223
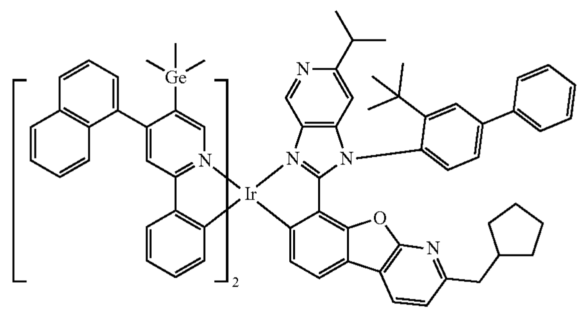
2224
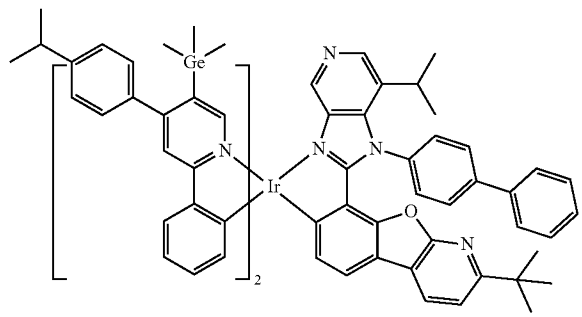
2225
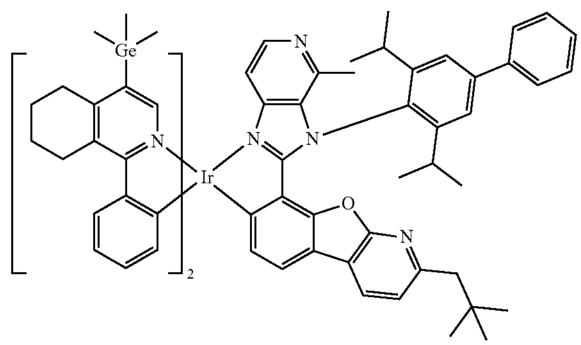

-continued
2226
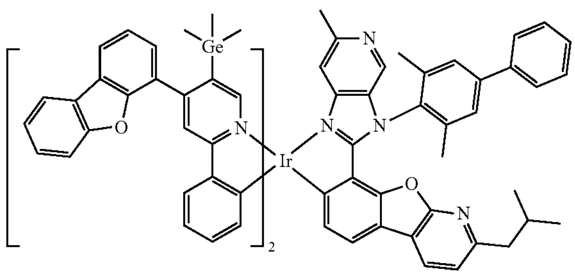
2227
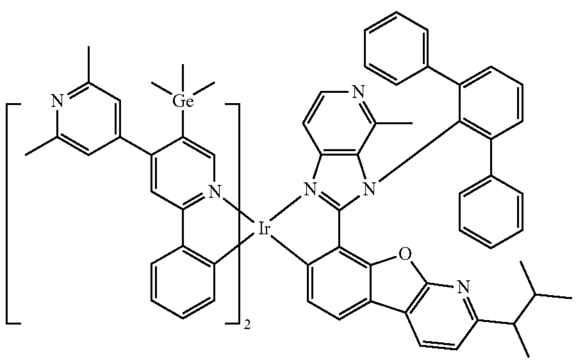
2228
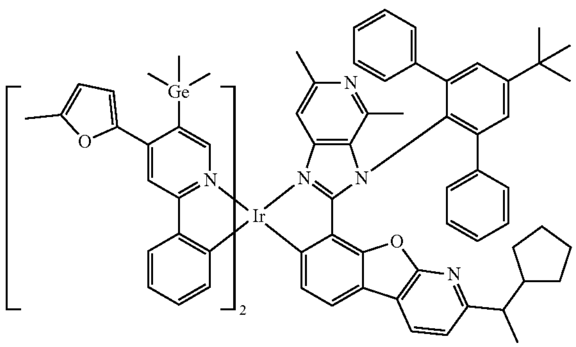
2229
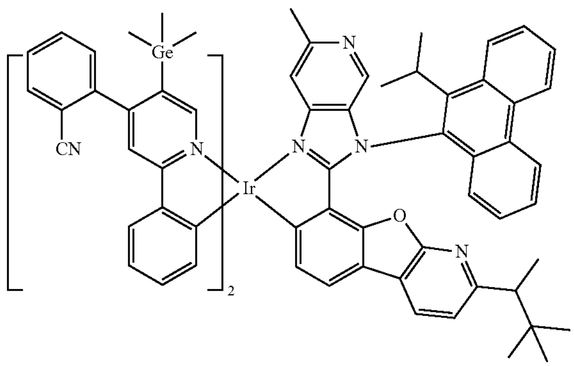

-continued
2230
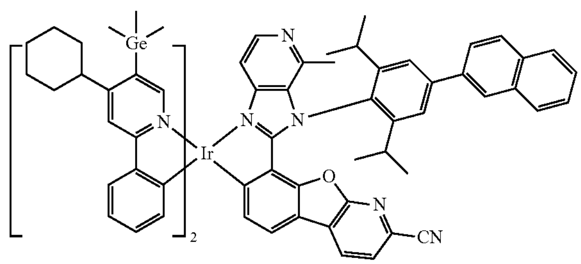
2231
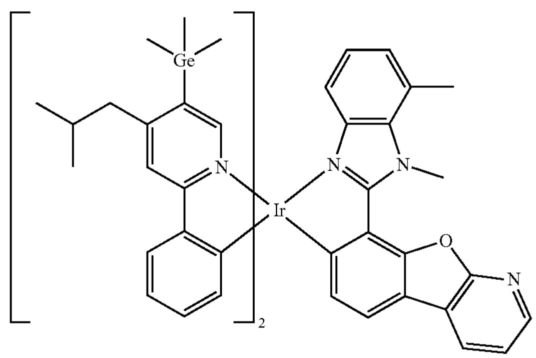
2232
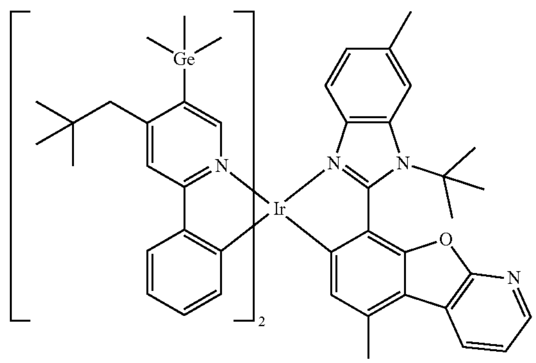
2233
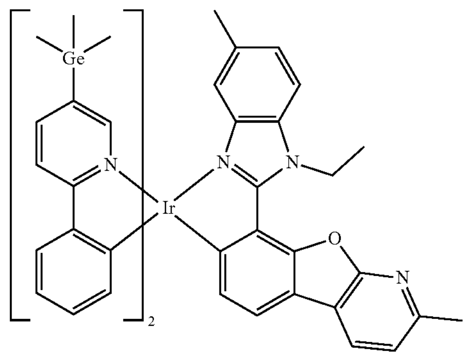

-continued
2234
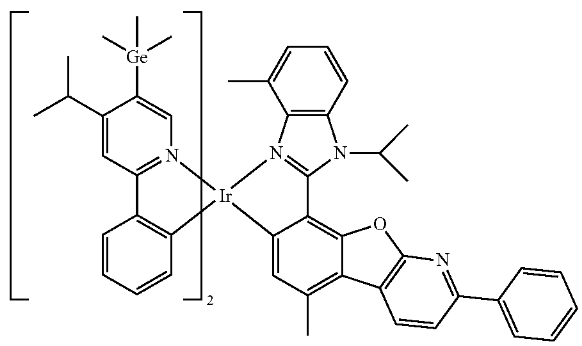
2235
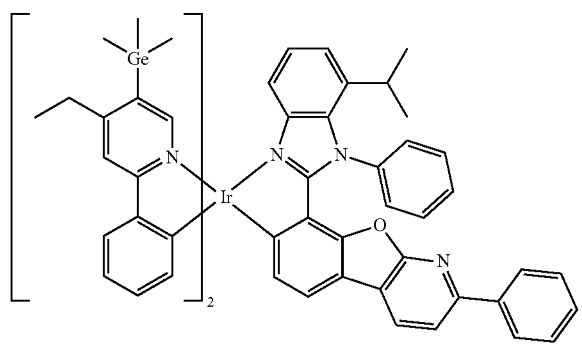
2236
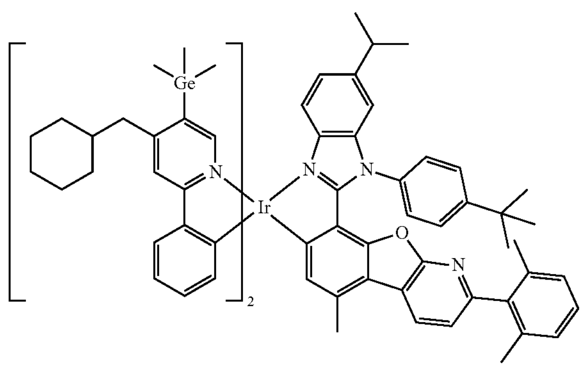
2237
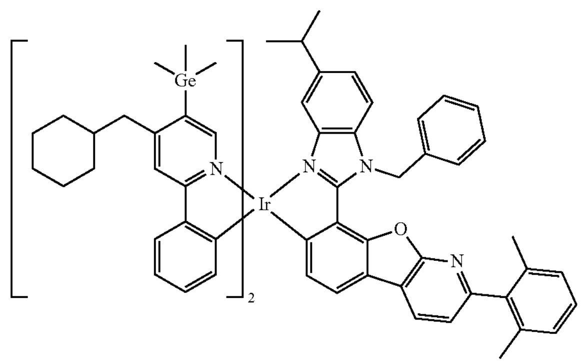

-continued
2238
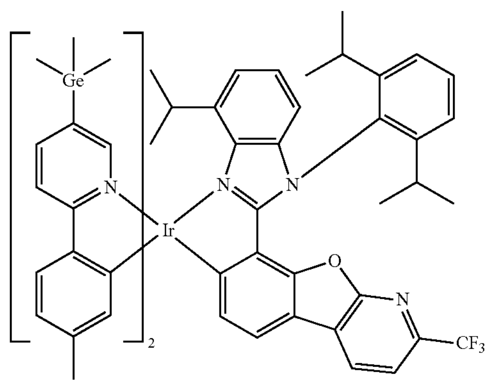
2239
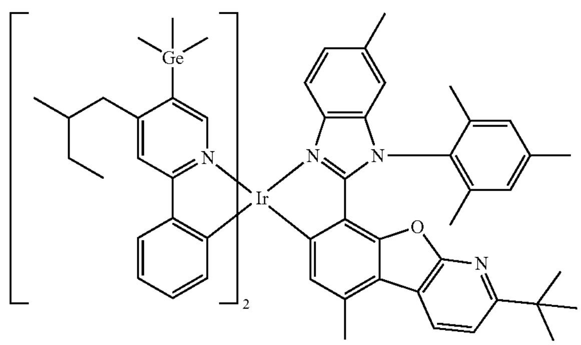
2240
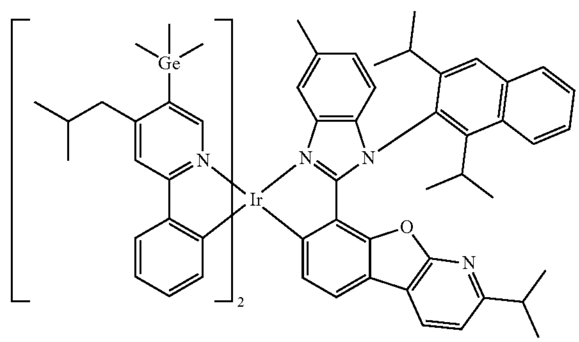
2241
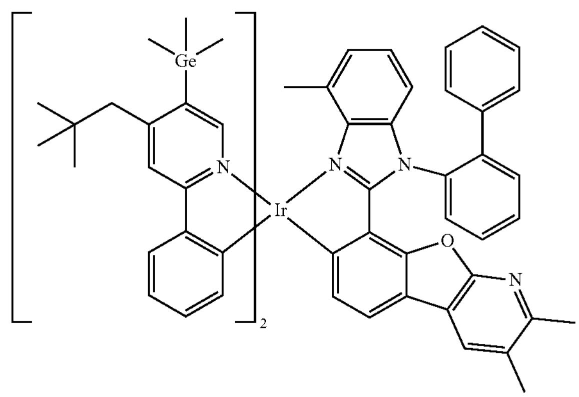

-continued
2242
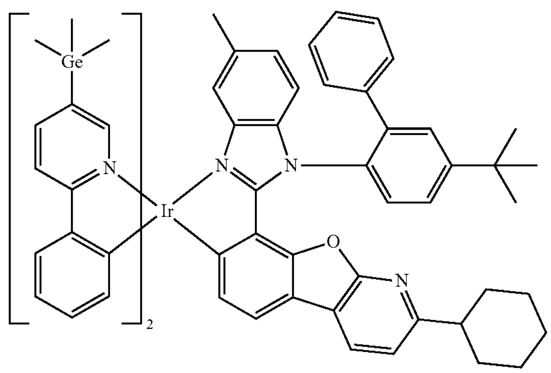
2243
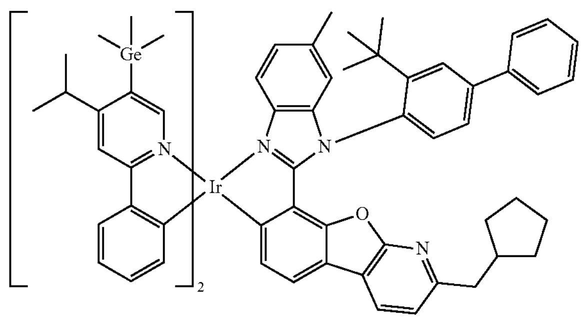
2244
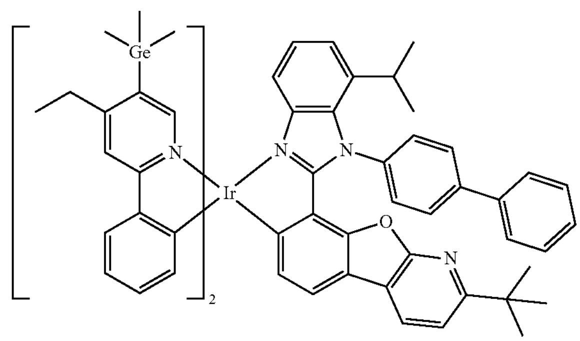
2245
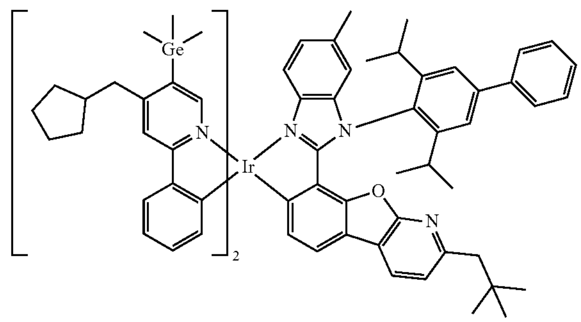

-continued
2246
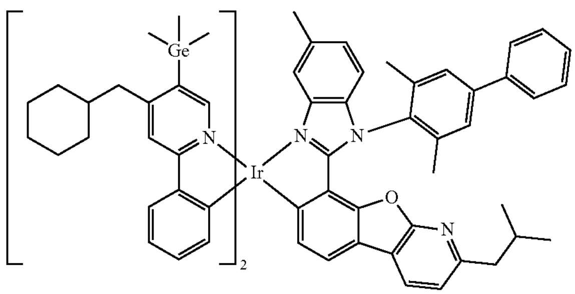
2247
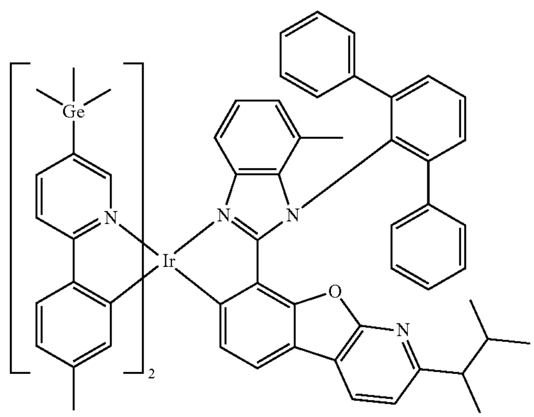
2248
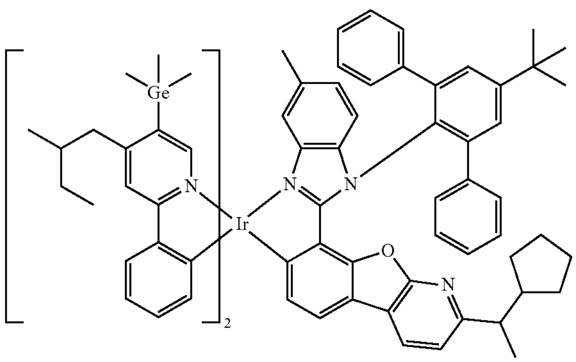
2249
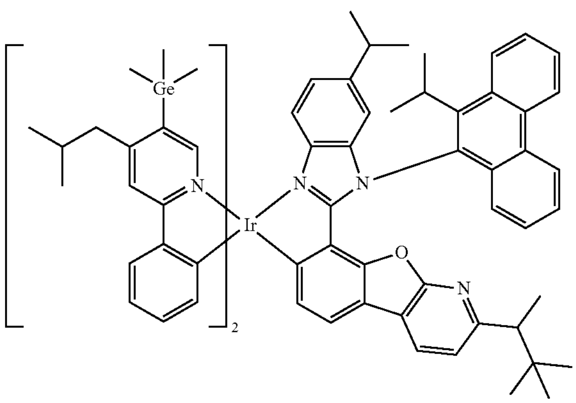

-continued
2250
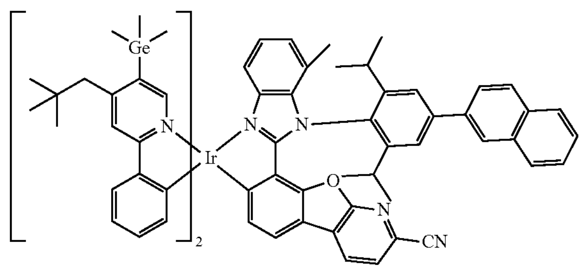
2251
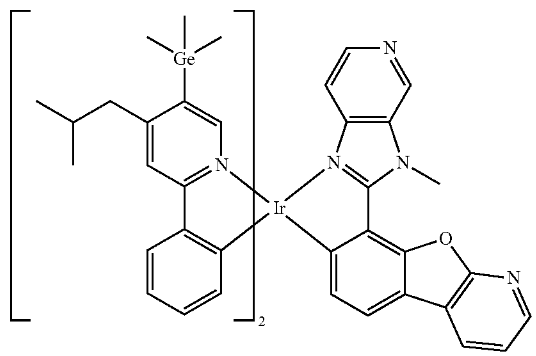
2252
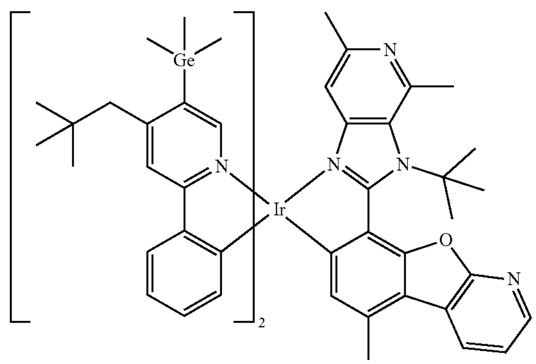
2253
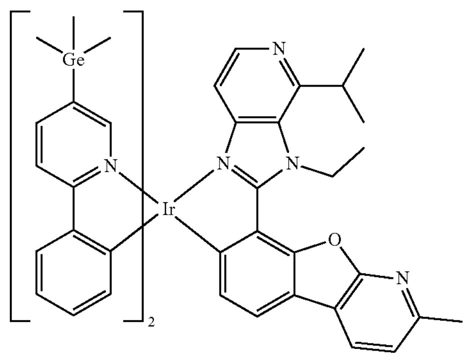

-continued
2254
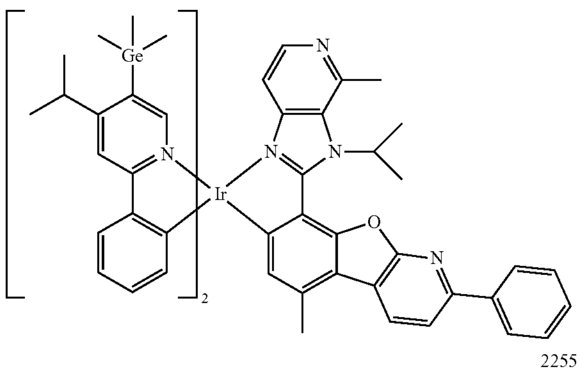
2255
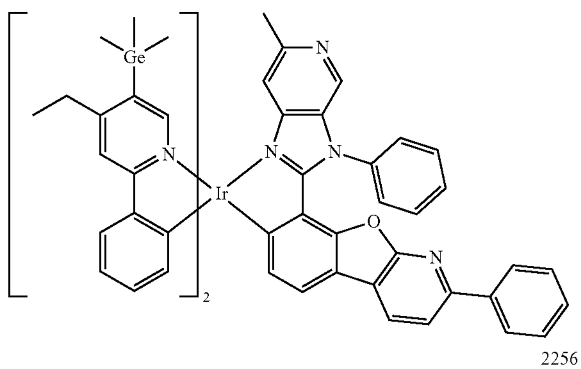
2256
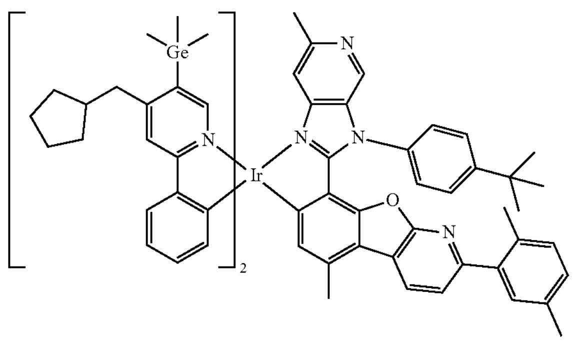
2257
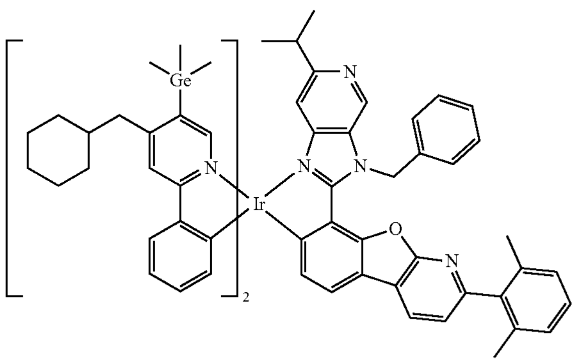

-continued
2258
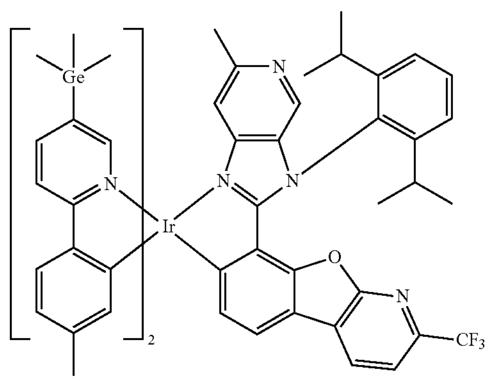
2259
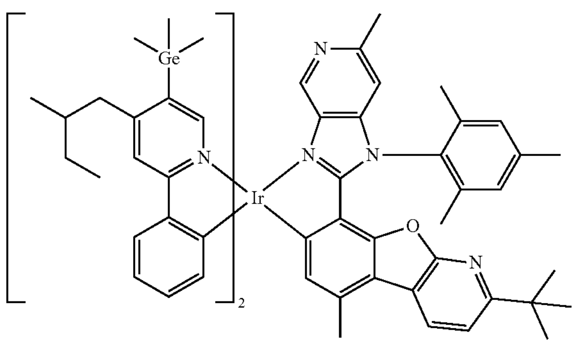
2260
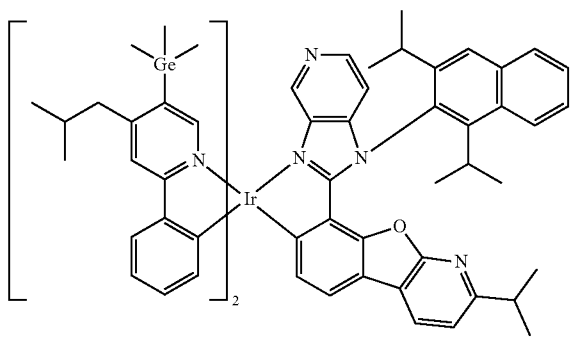
2261
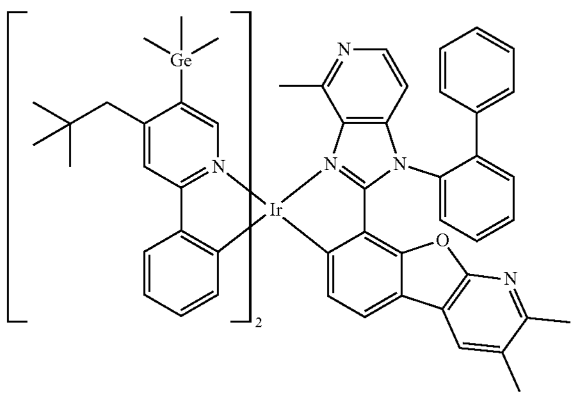

-continued
2262
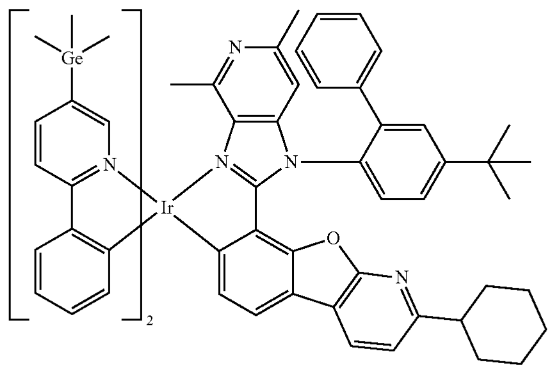
2263
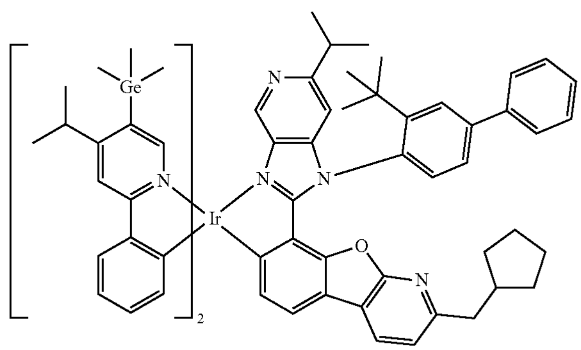
2264
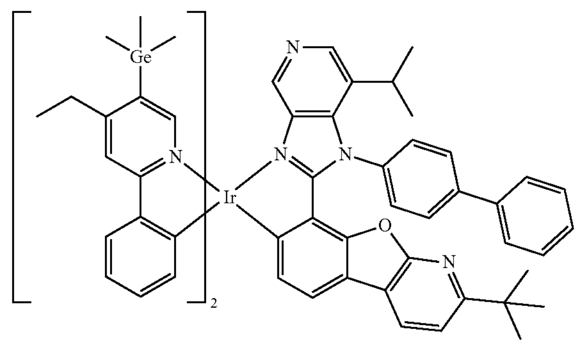
2265
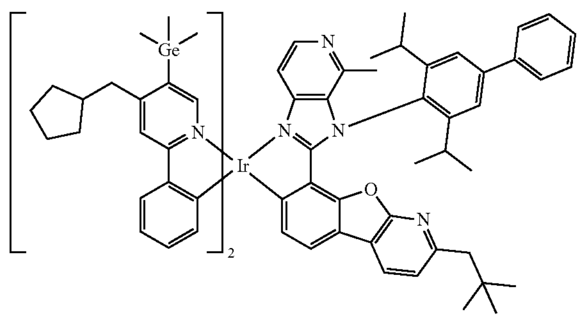

-continued
2266
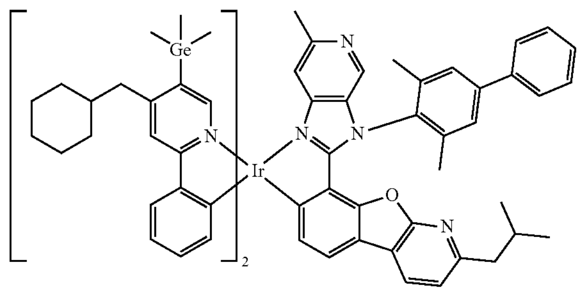
2267
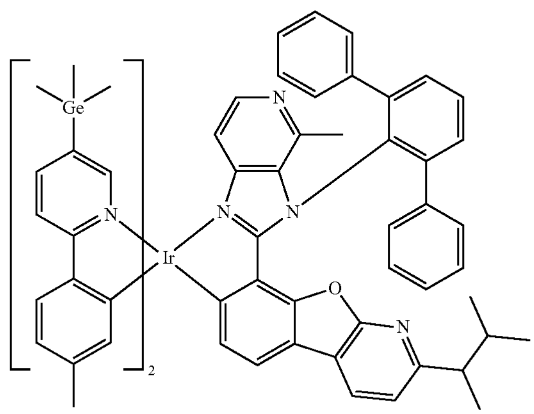
2268
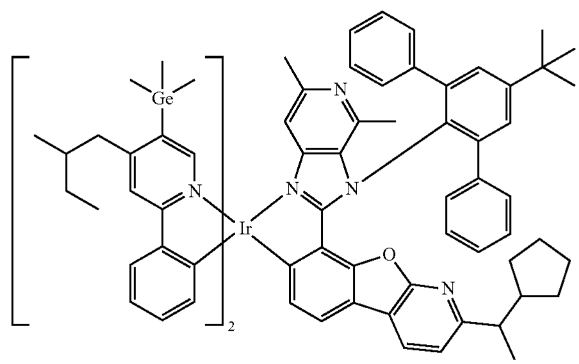
2269
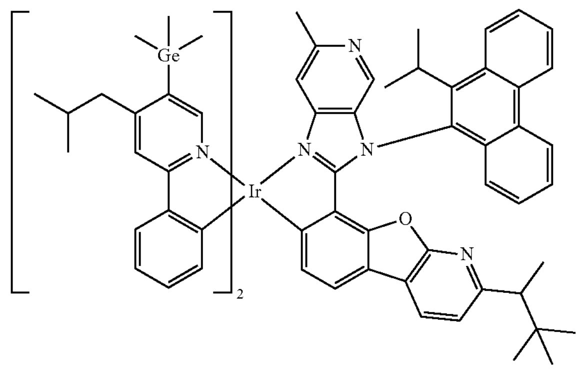

-continued
2270
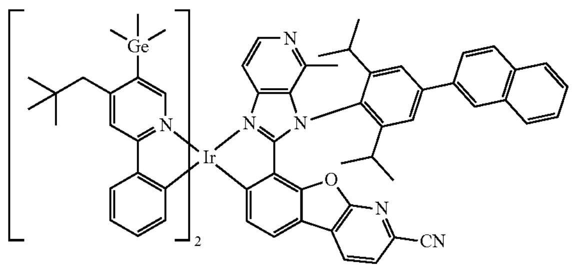
2271
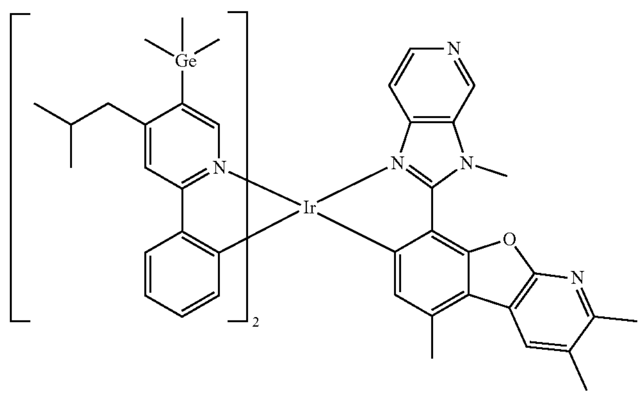
2272
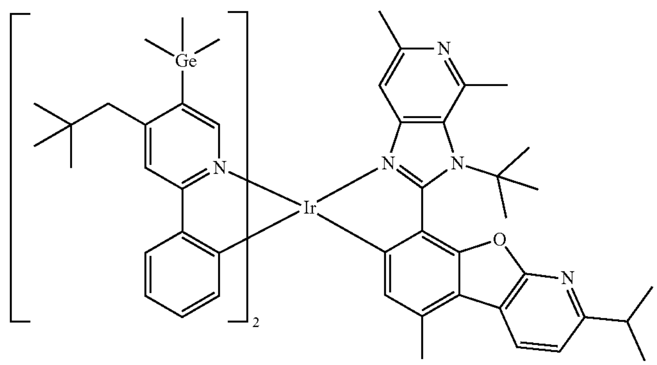
2273
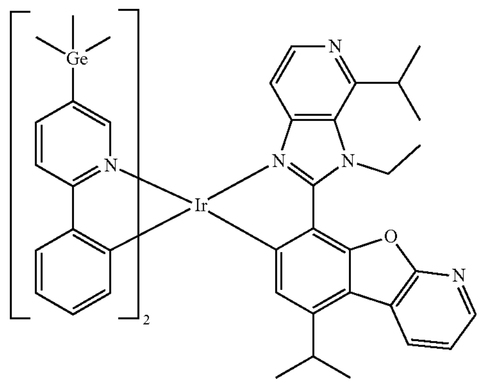

-continued
2274
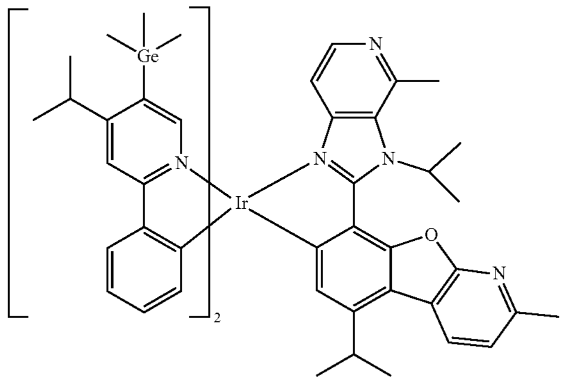
2275
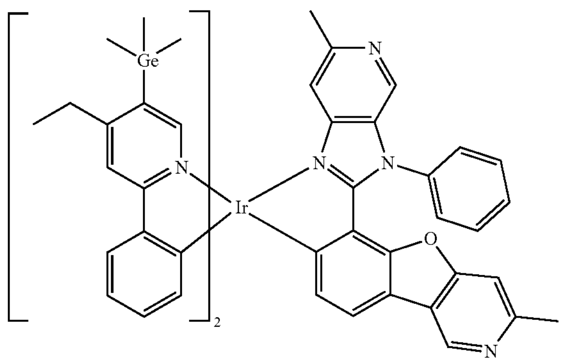
2276
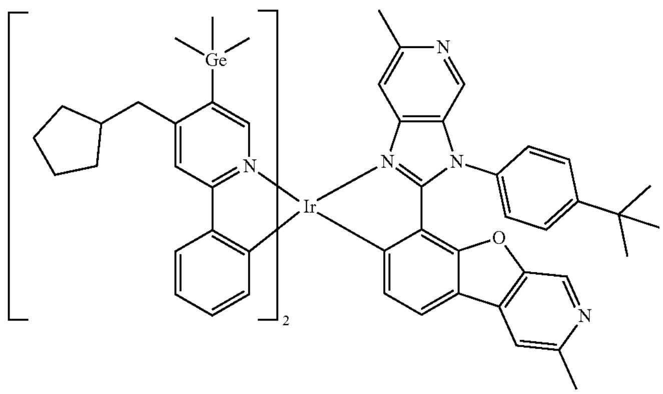
2277
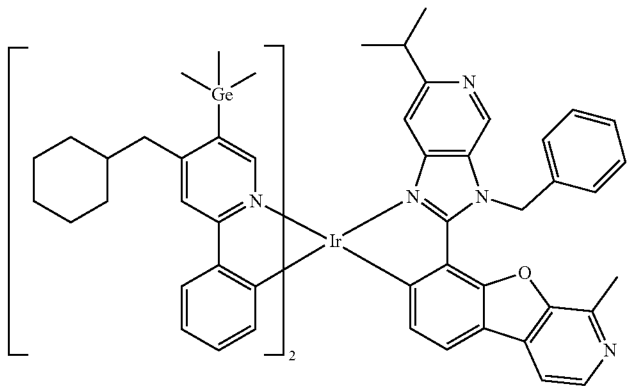

-continued
2278
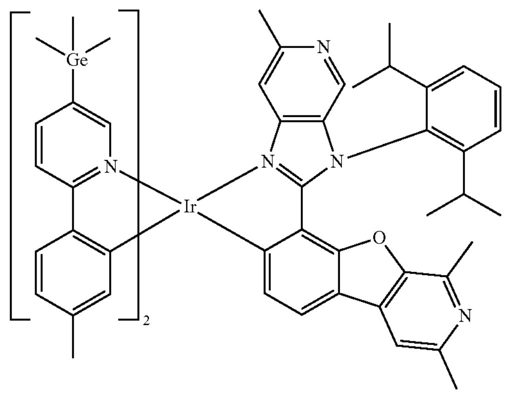
2279
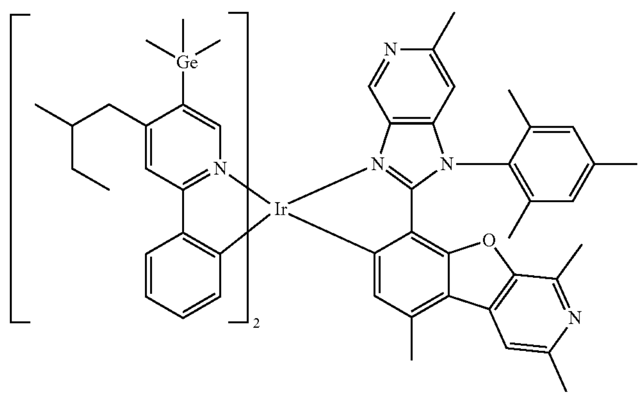
2280
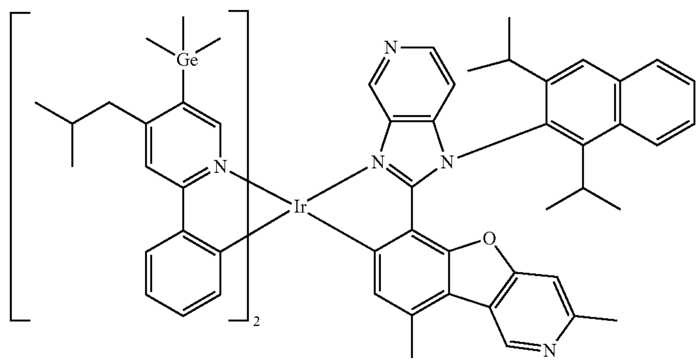
2281
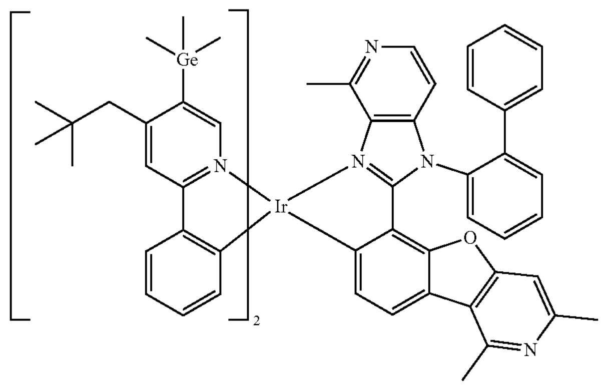

-continued
2282
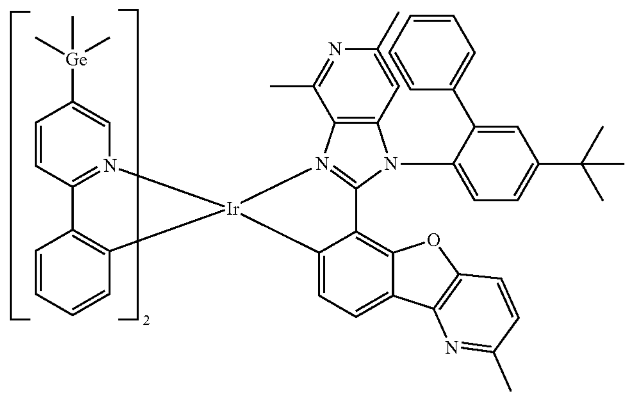
2283
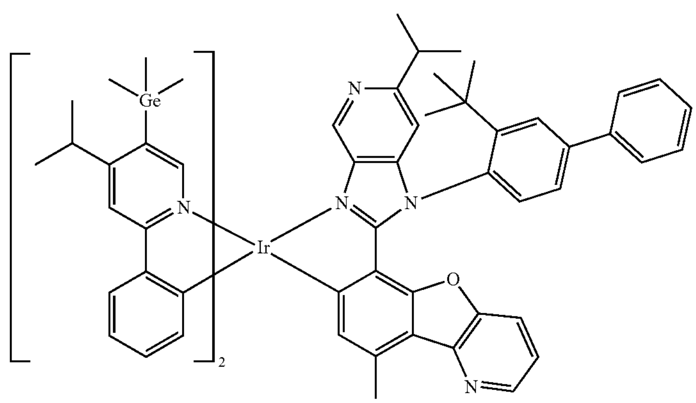
2284
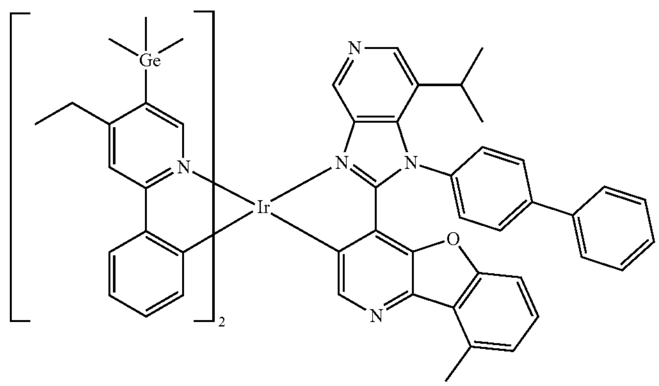
2285
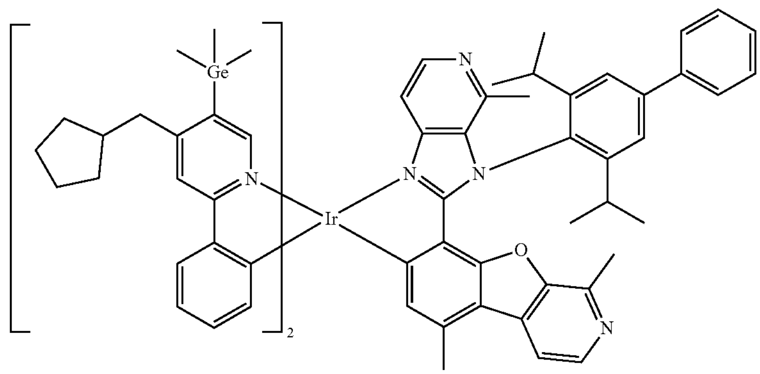

-continued
2286
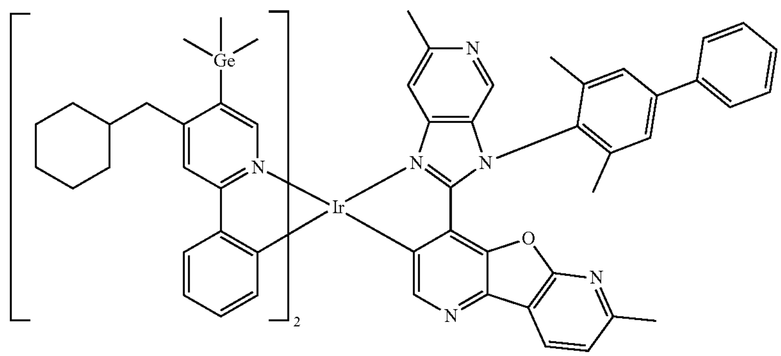
2287
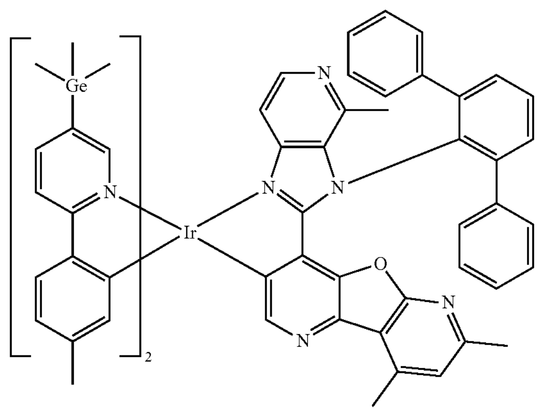
2288
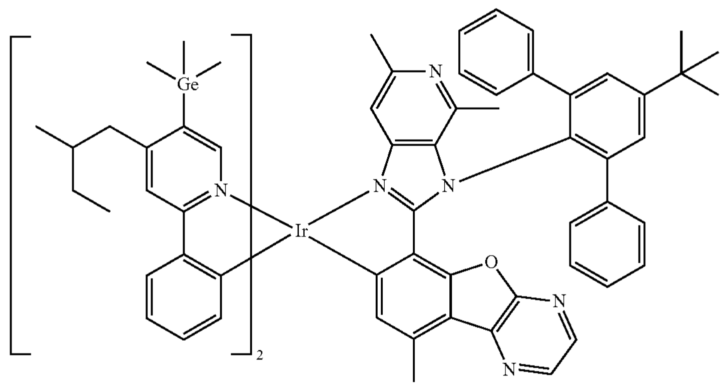
2289
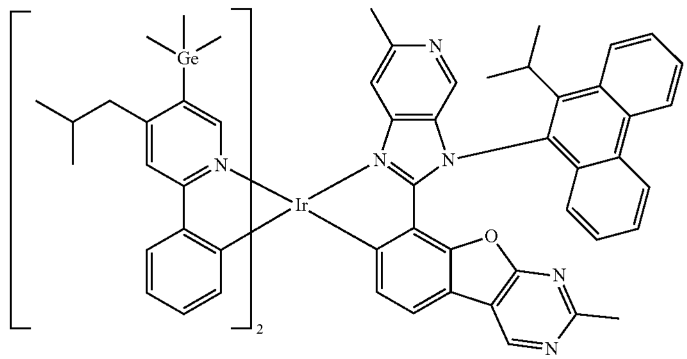

-continued
2290
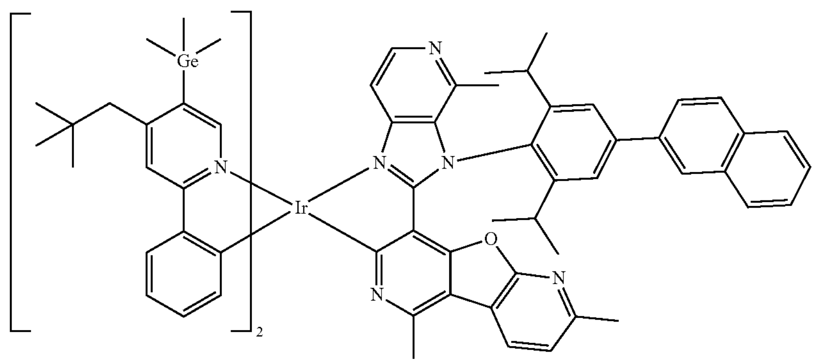
2291
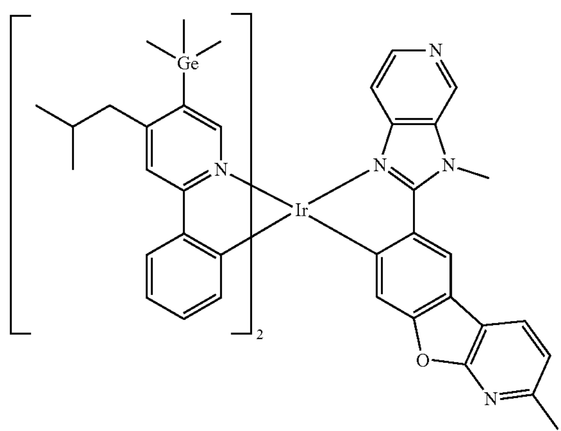
2292
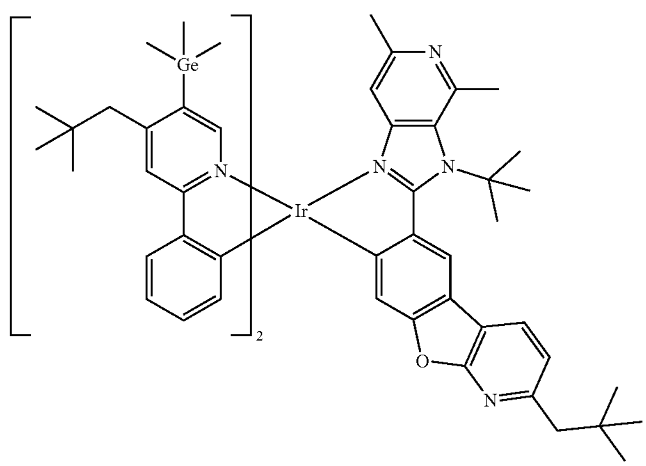

-continued
2293
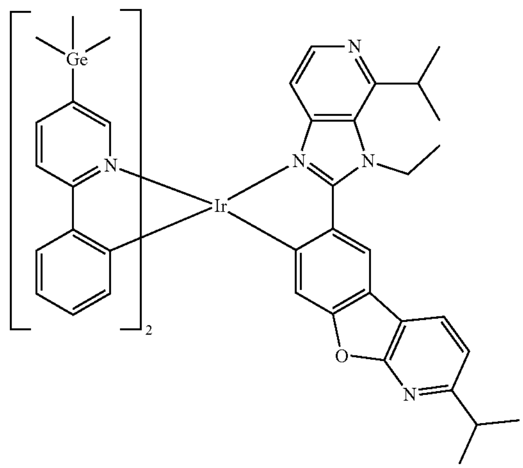
2294
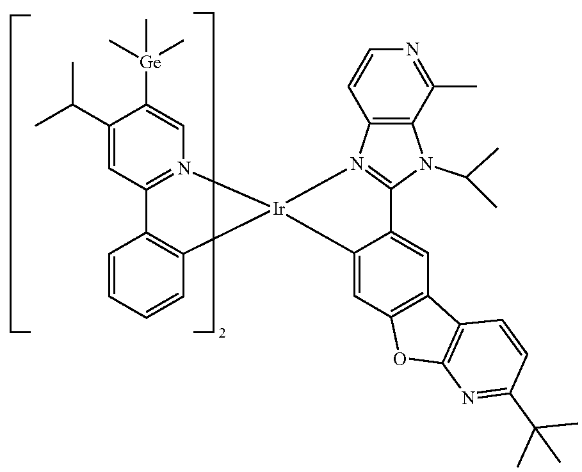
2295
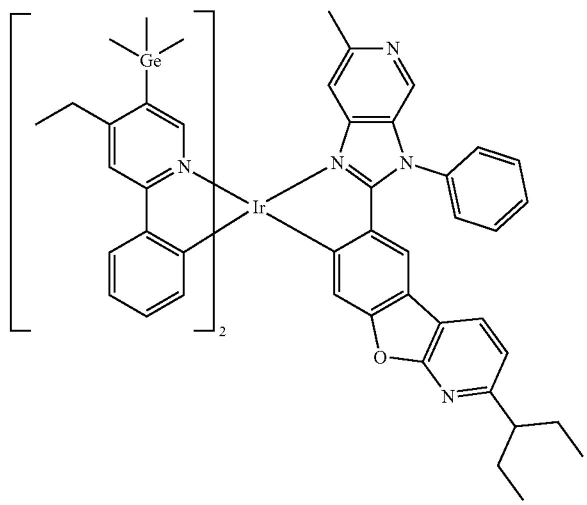

-continued
2296
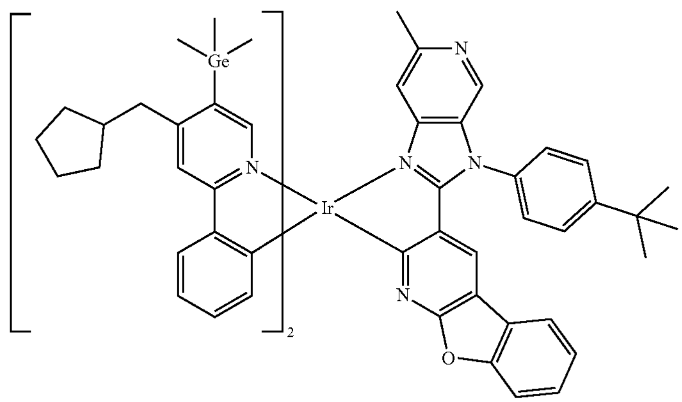
2297
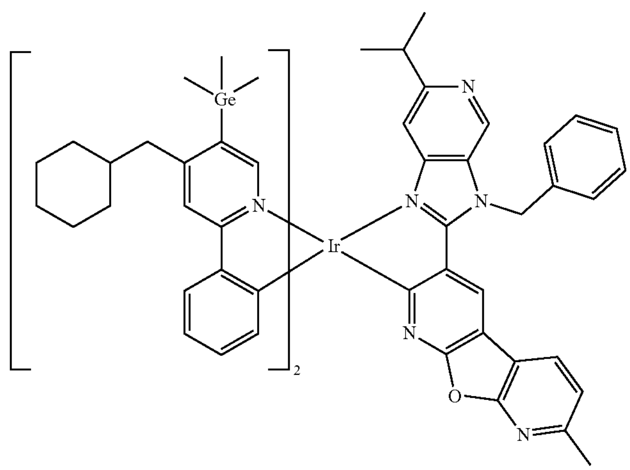
2298
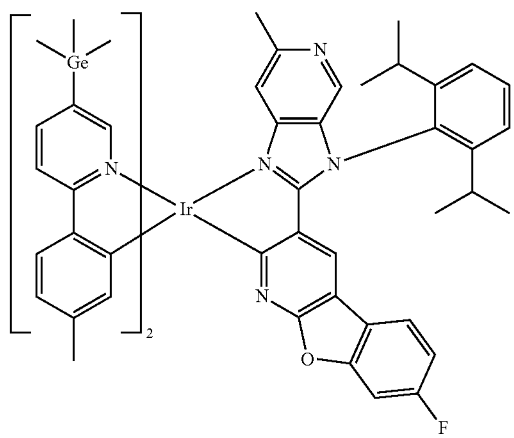

-continued
2299
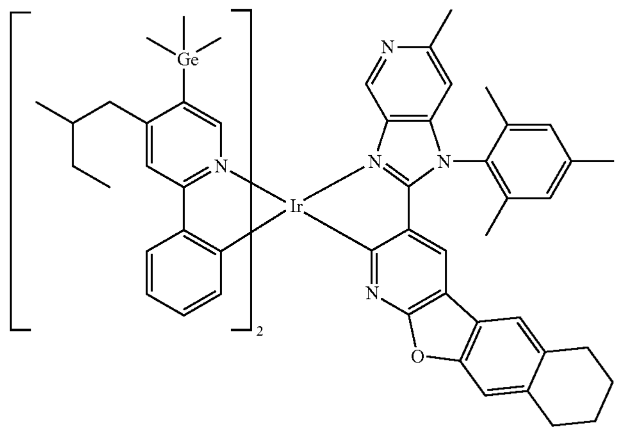
2300
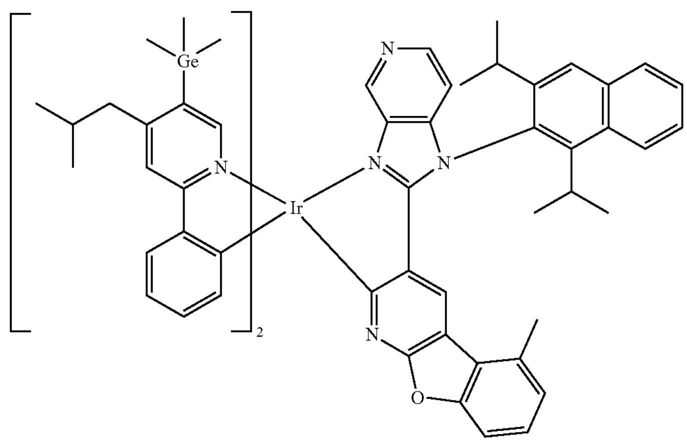
2301
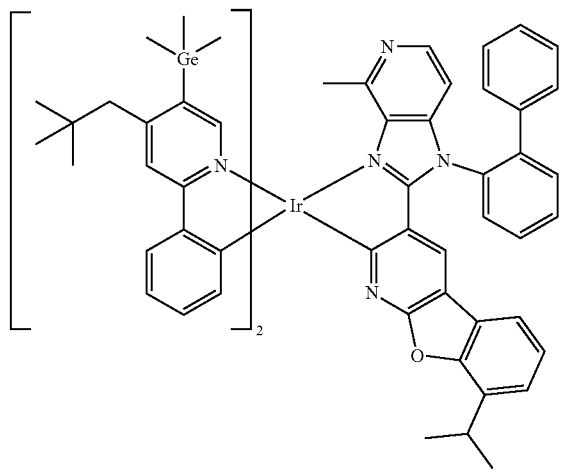

-continued
2302
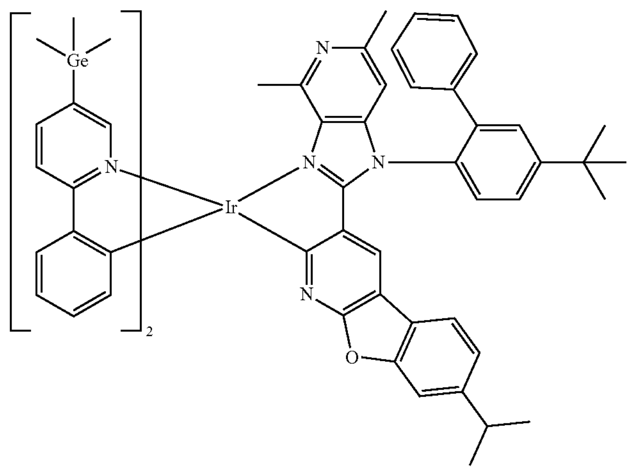
2303
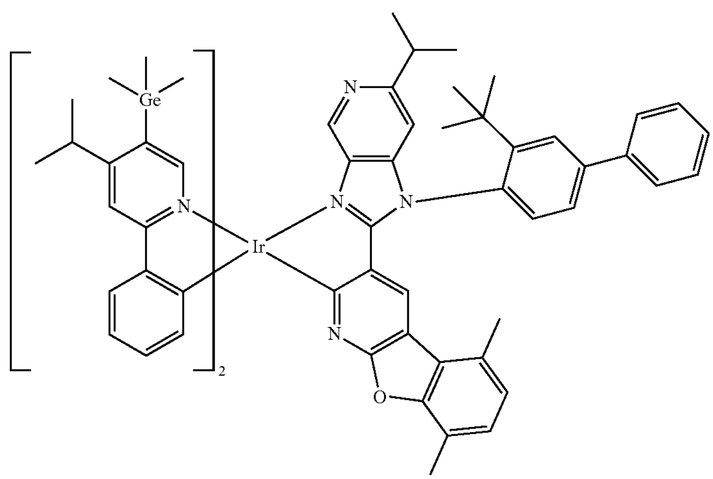
2304
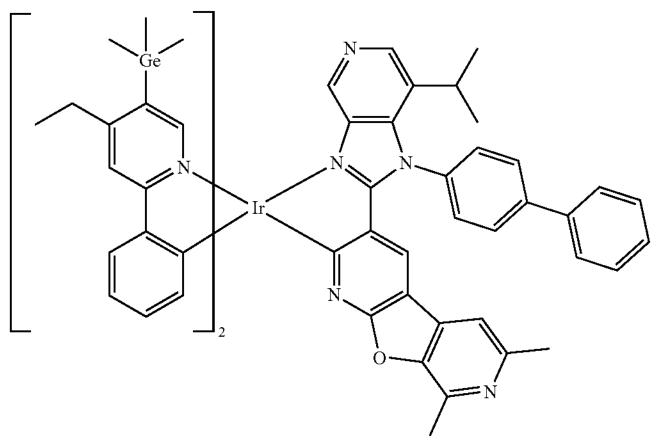

-continued
2305
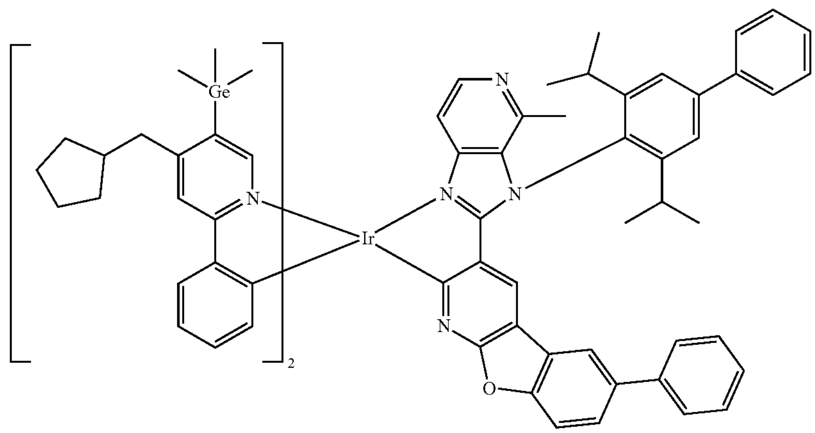
2306
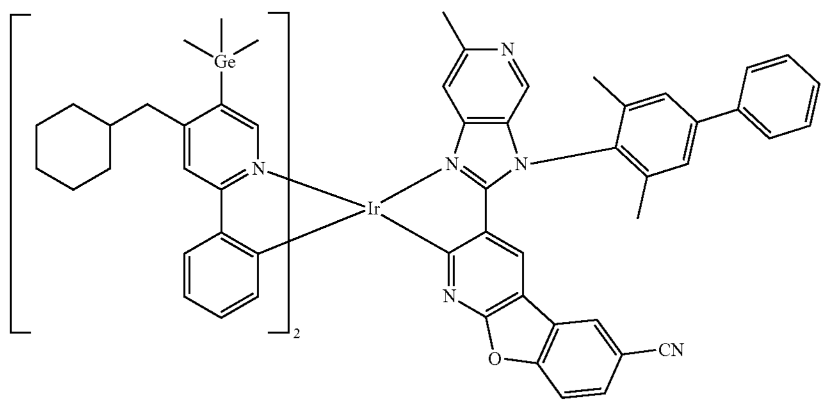
2307
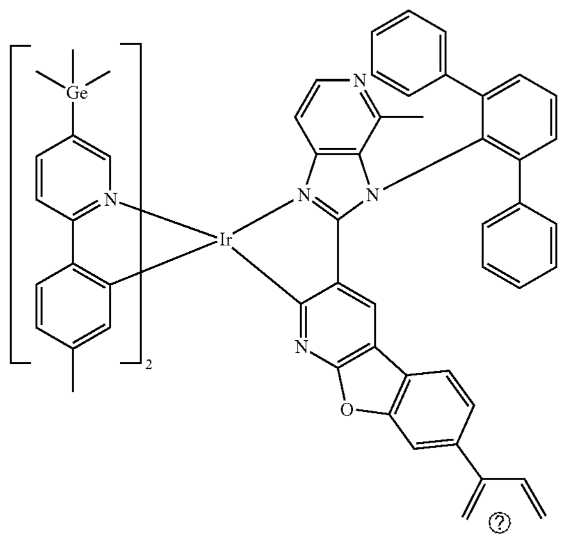

-continued
2308
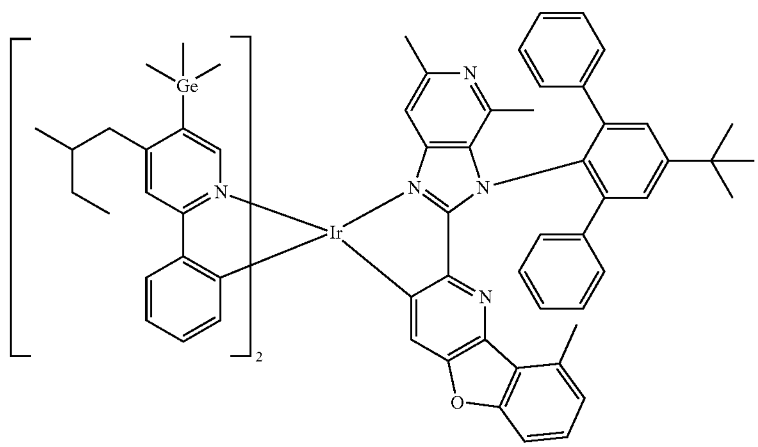
2309
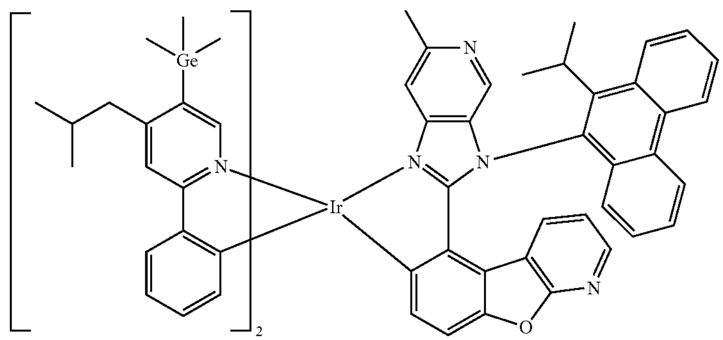
2310
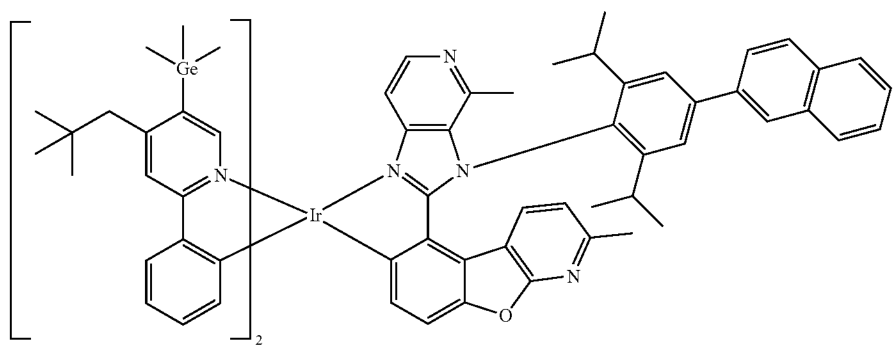
2311
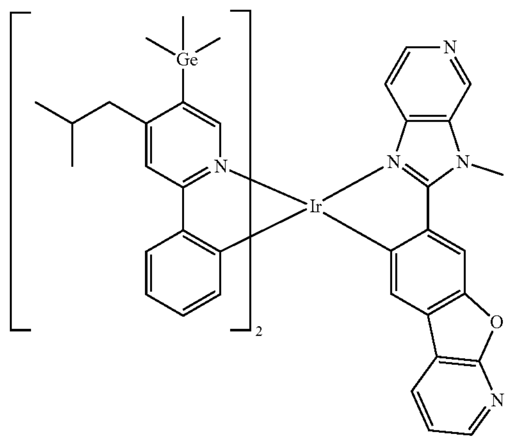

-continued
2312
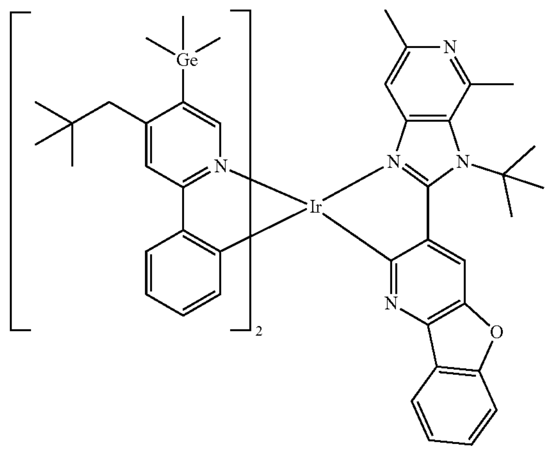
2313
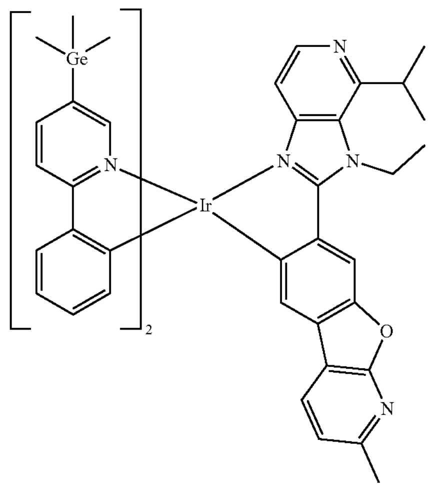
2314
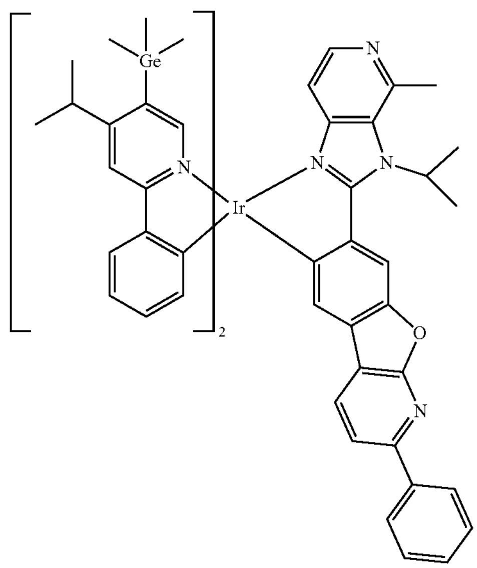

-continued
2315
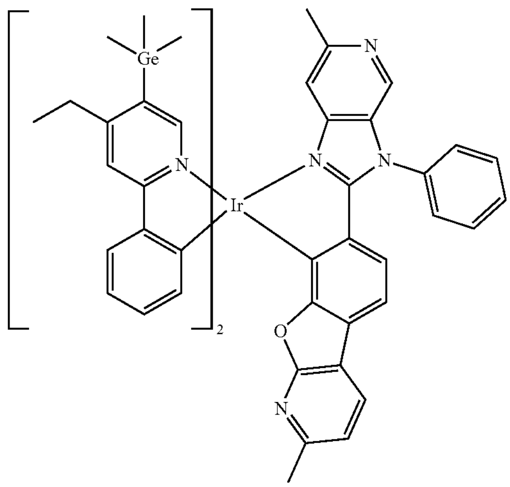
2316
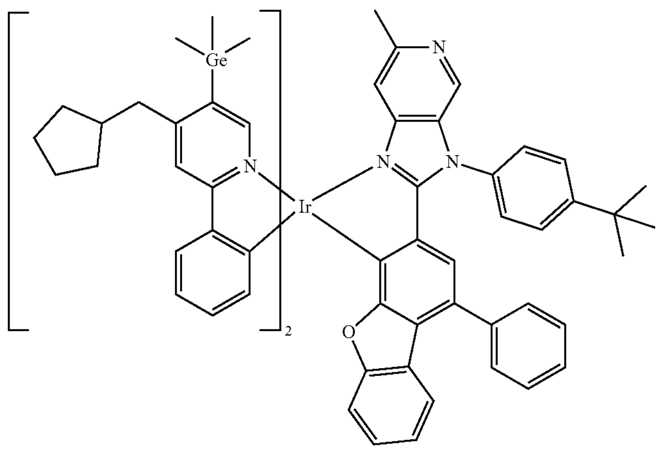
2317
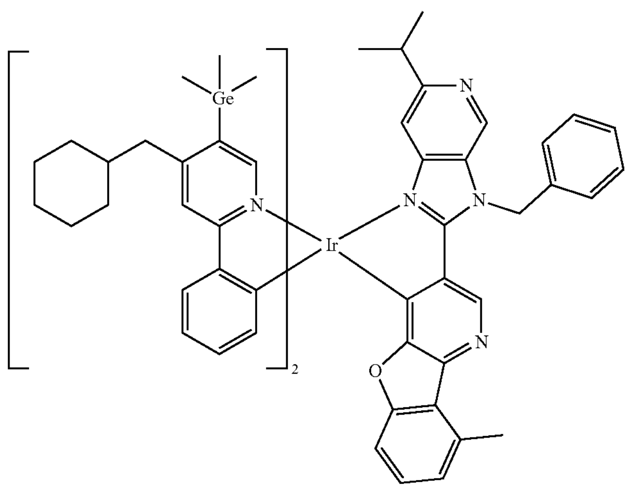

-continued
2318
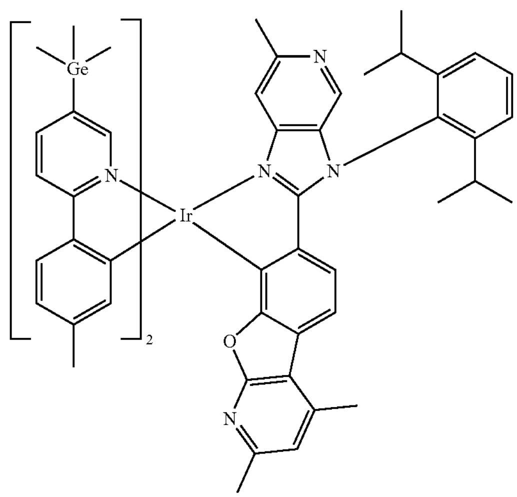
2319
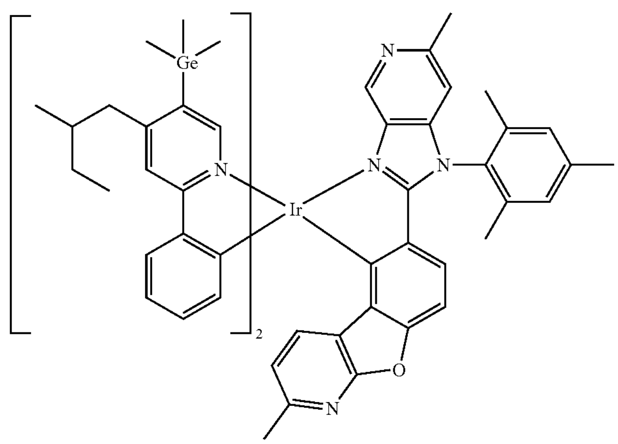
2320
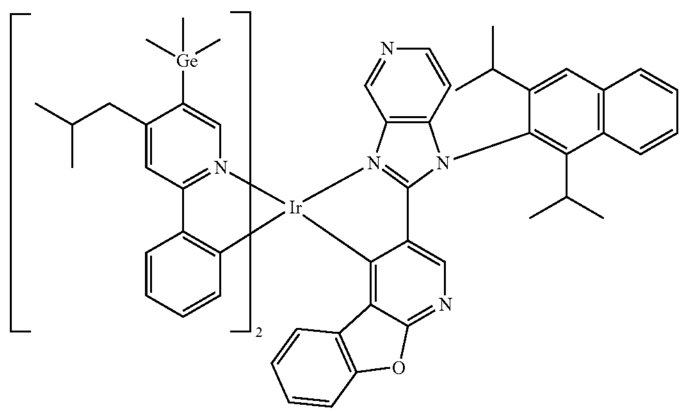

-continued
2321
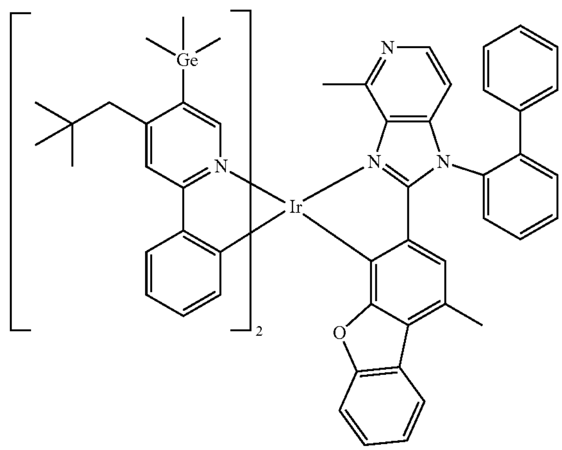
2322
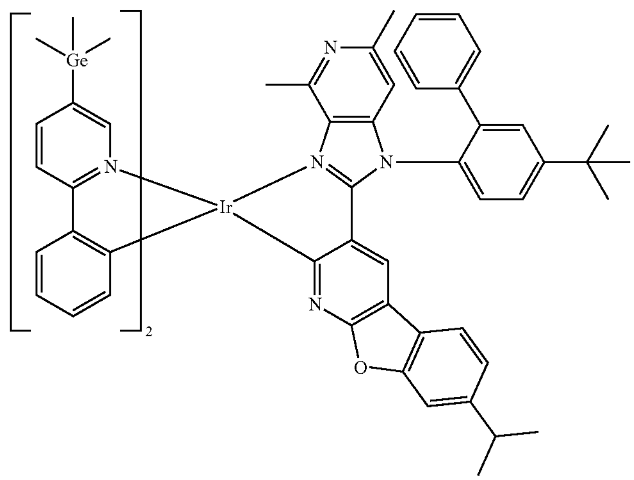
2323
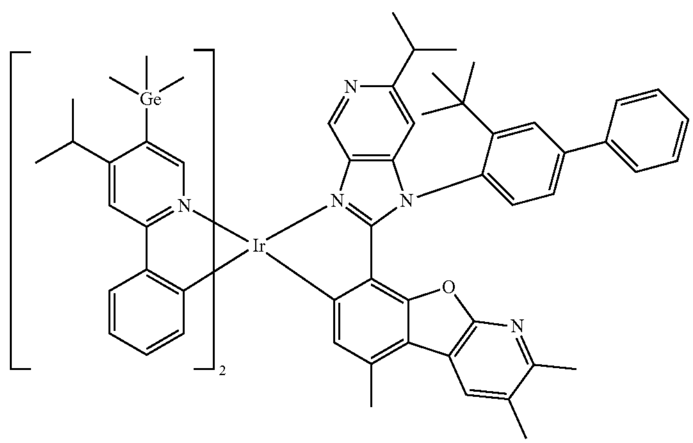

-continued
2324
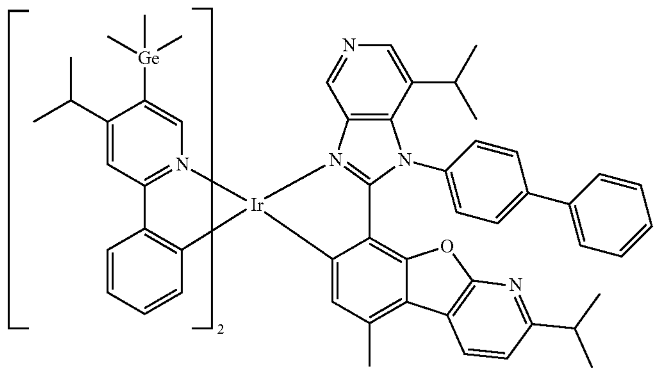
2325
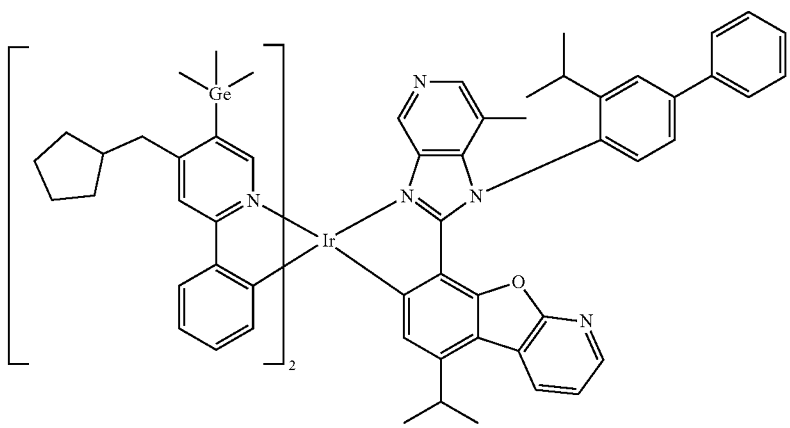
2326
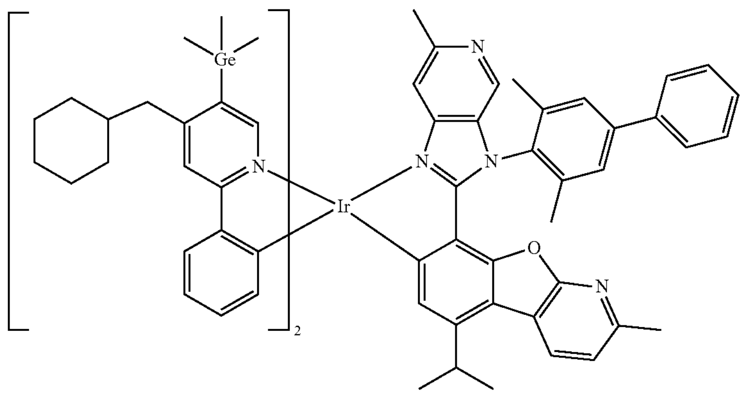
2327
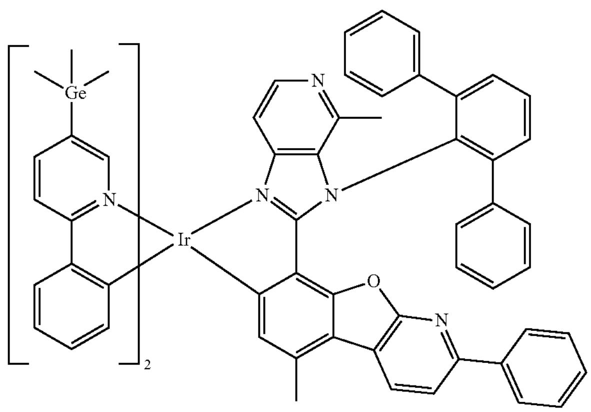

-continued
2328
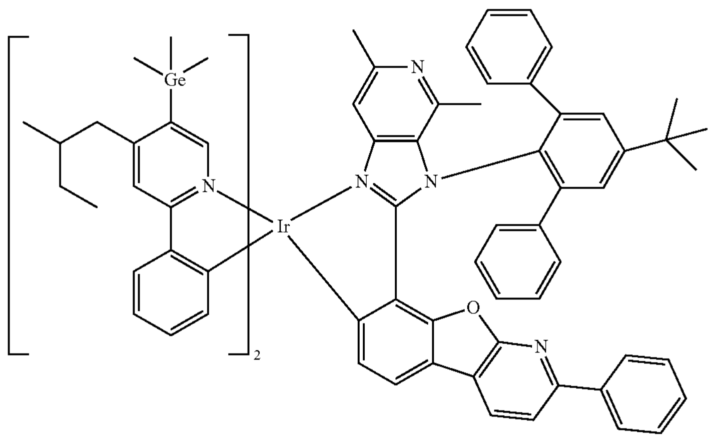
2329
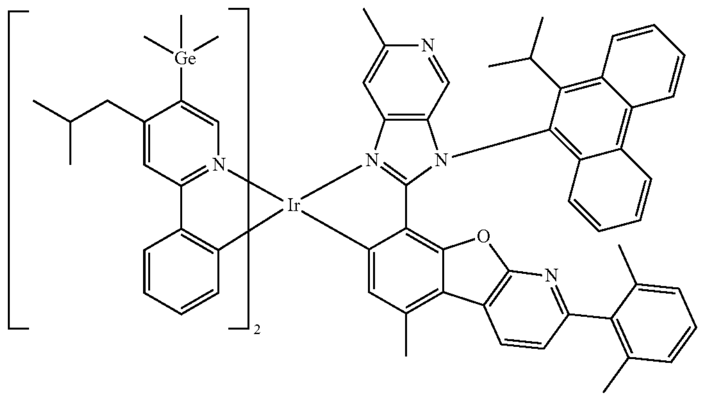
2330
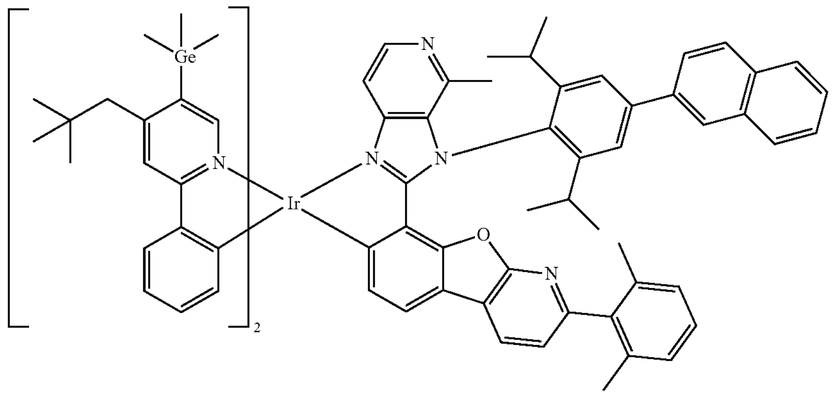
2331
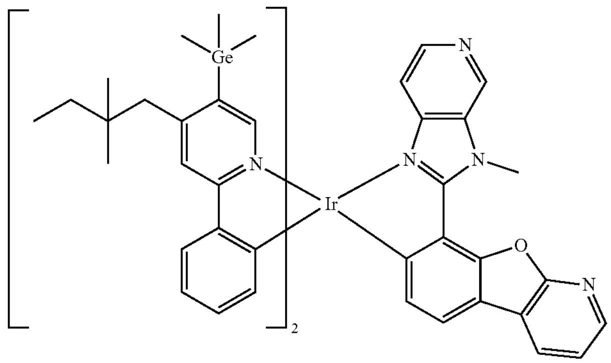

-continued
2332
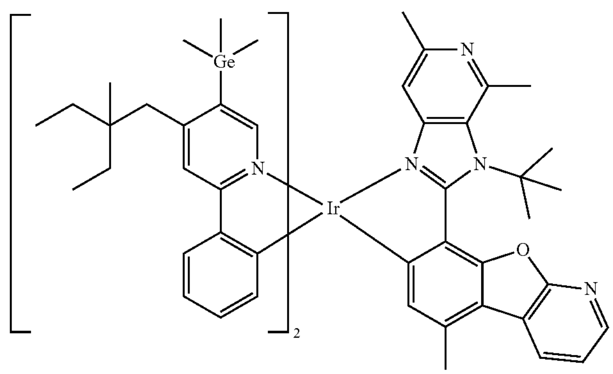
2333
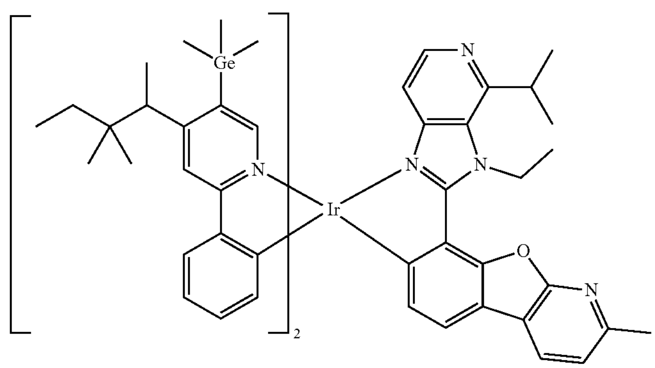
2334
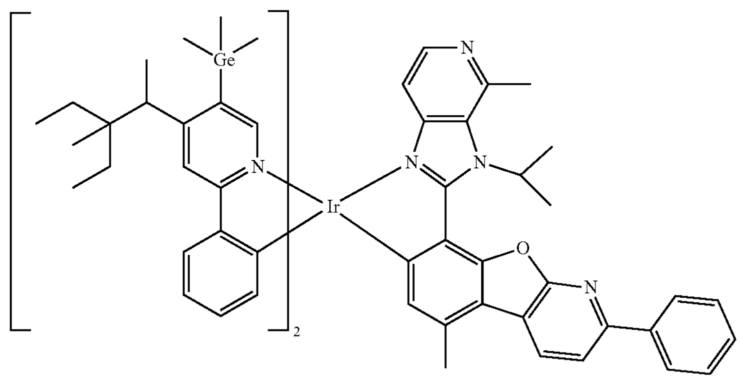
2335
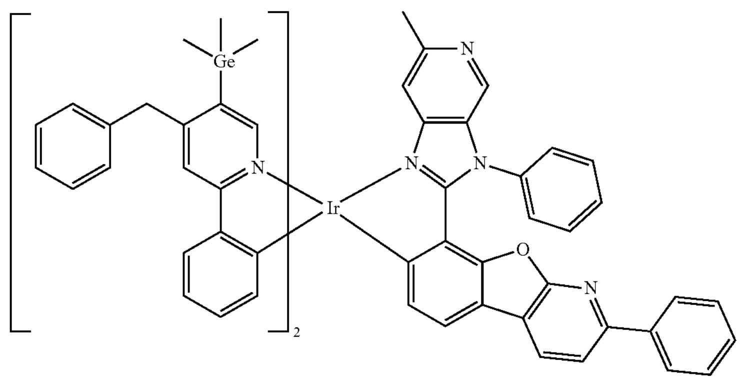

-continued
2336
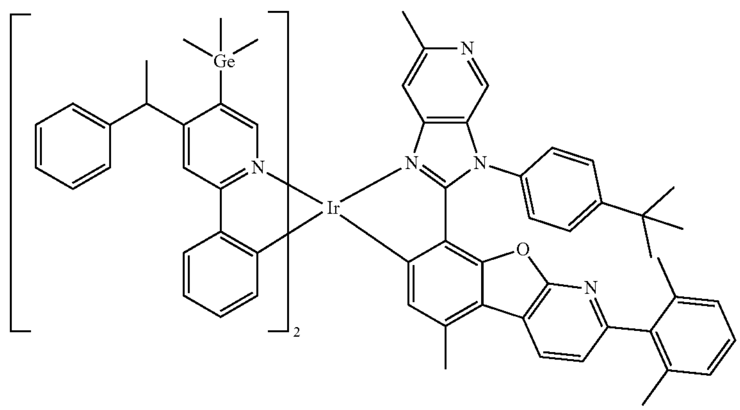
2337
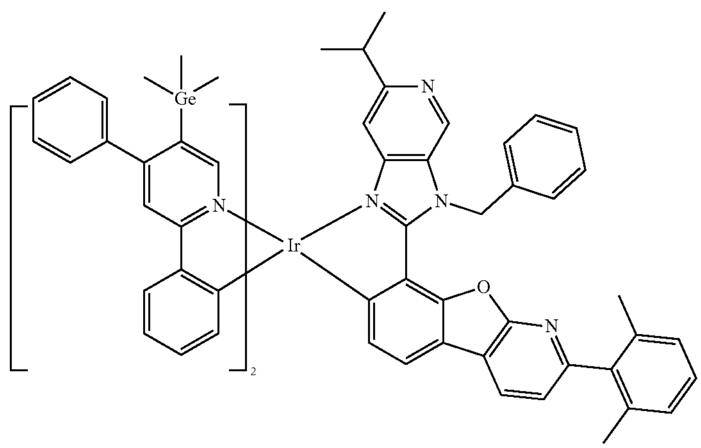
2338
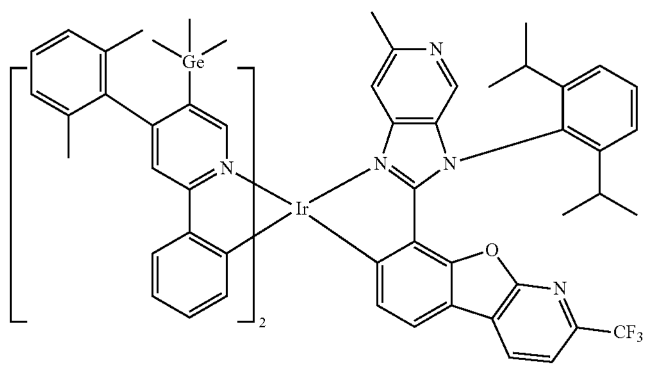
2339
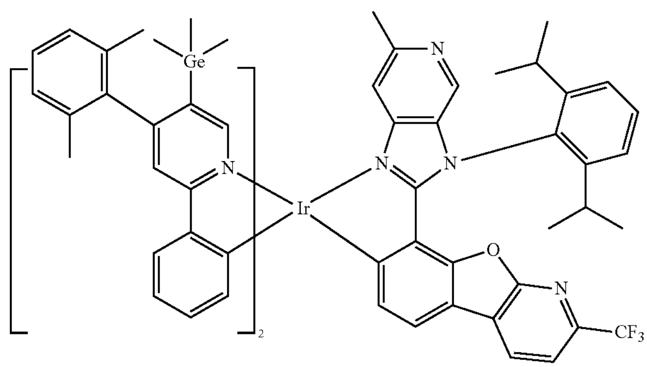

-continued
2339
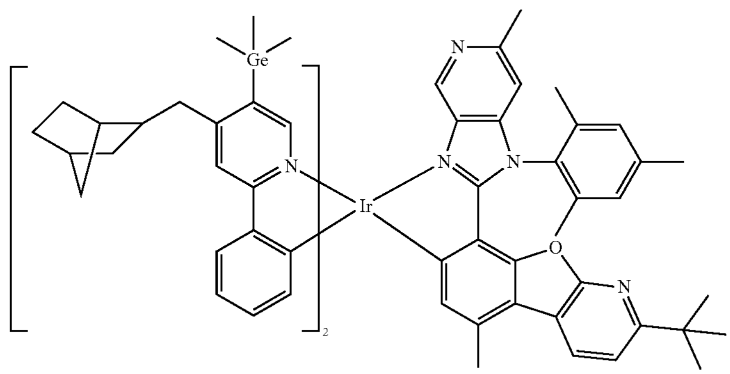
2340
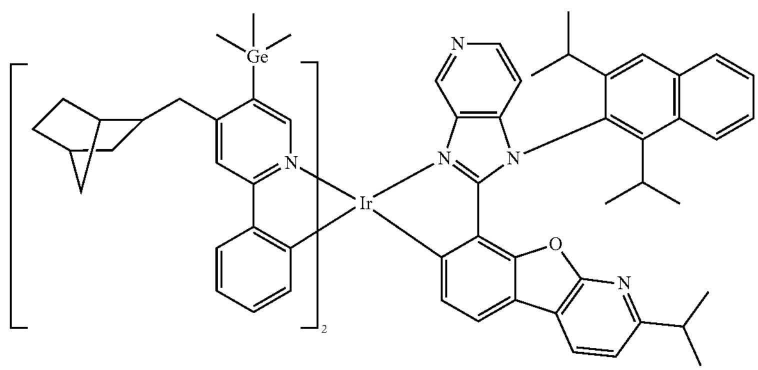
2341
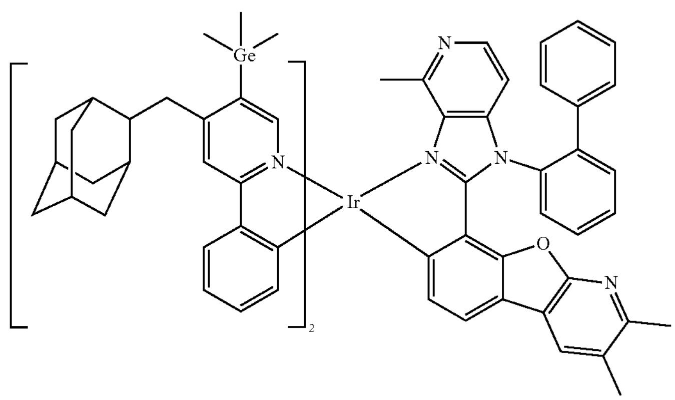
2342
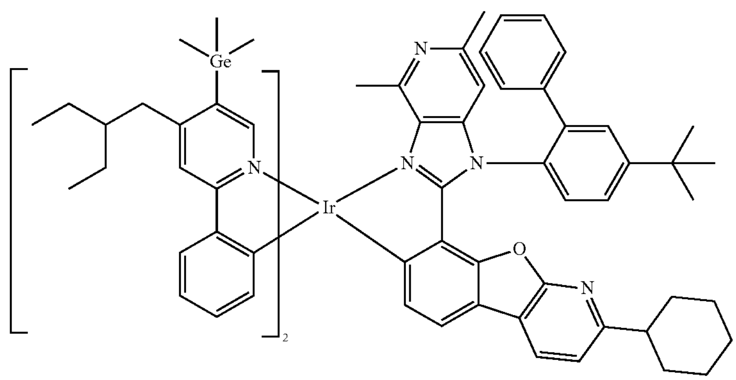

-continued
2343
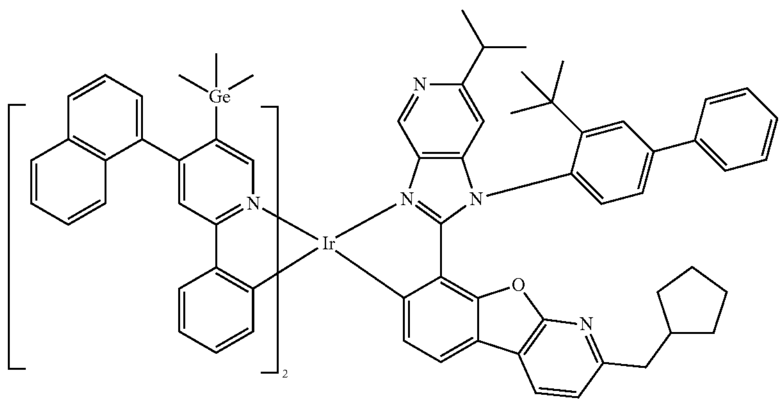
2344
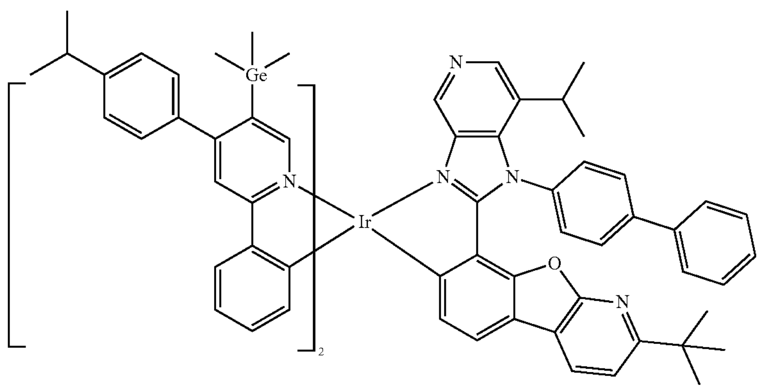
2345
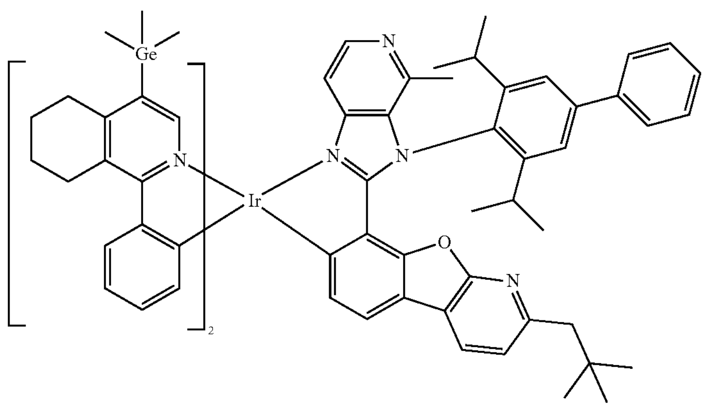
2346
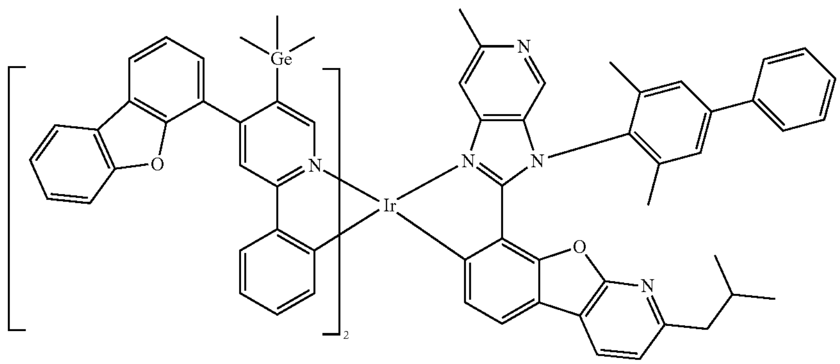

-continued
2347
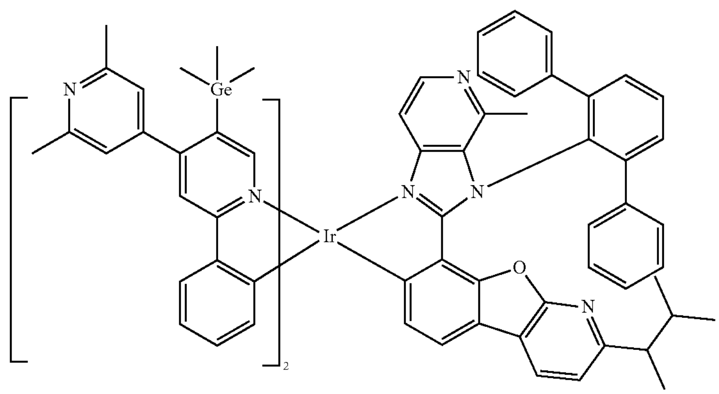
2348
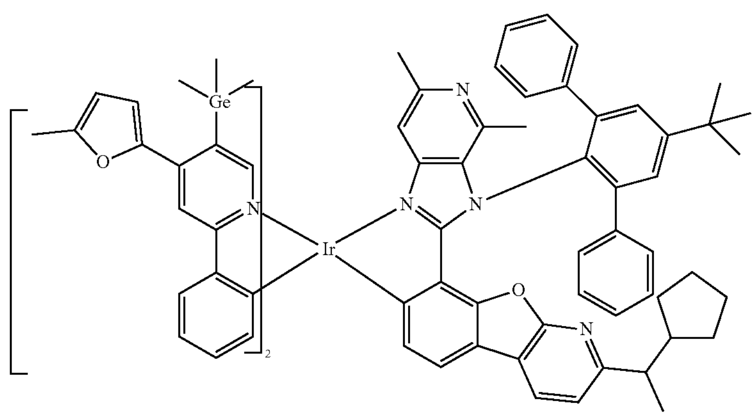
2349
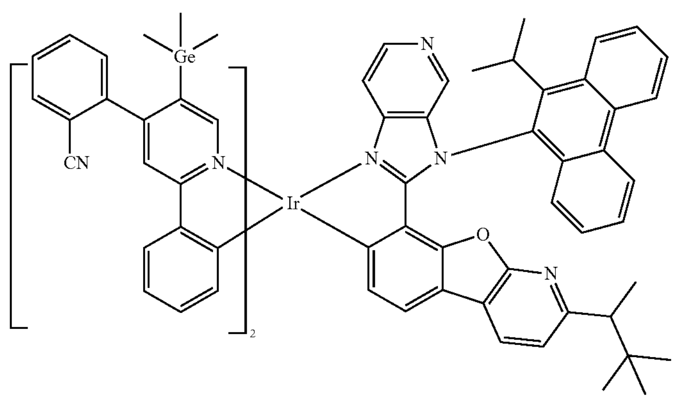
2350
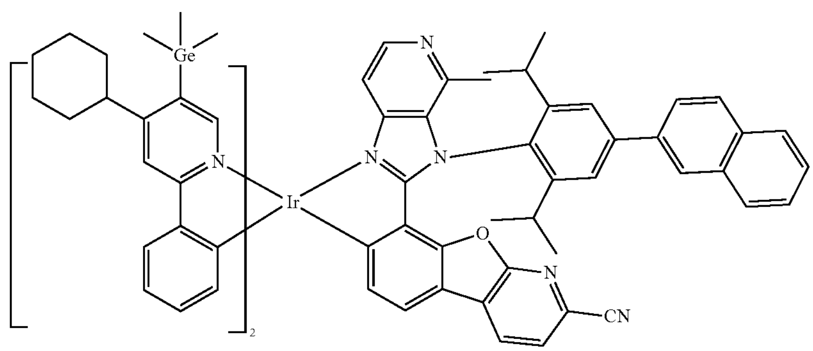

-continued
2351
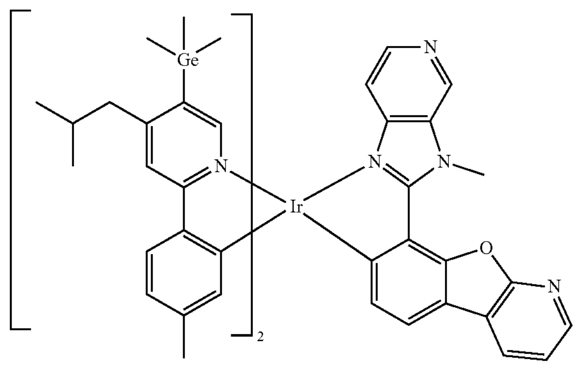
2352
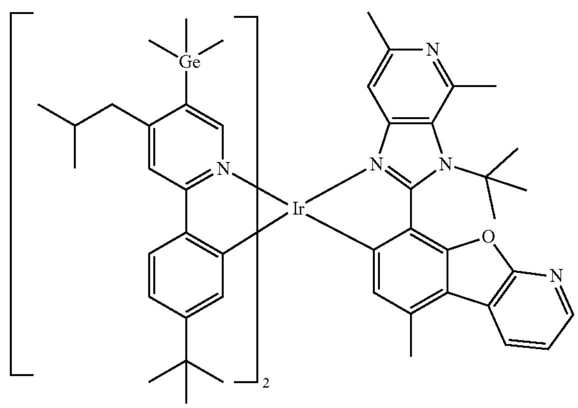
2353
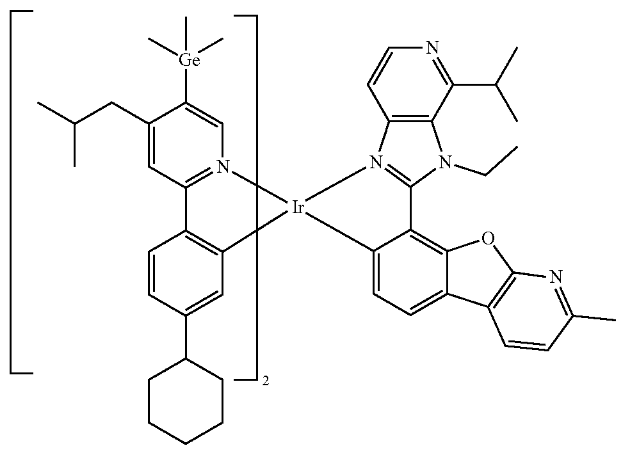
2354
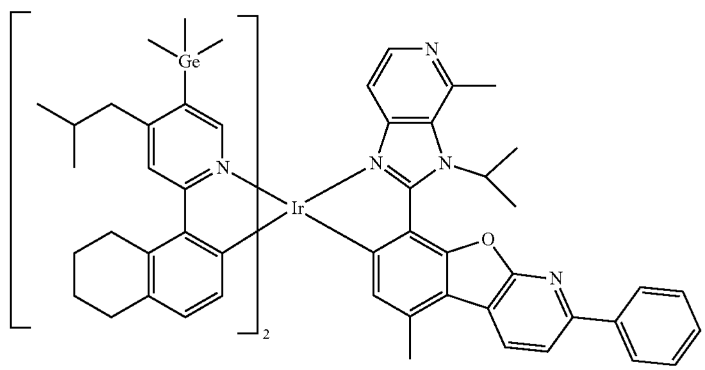

-continued
2355
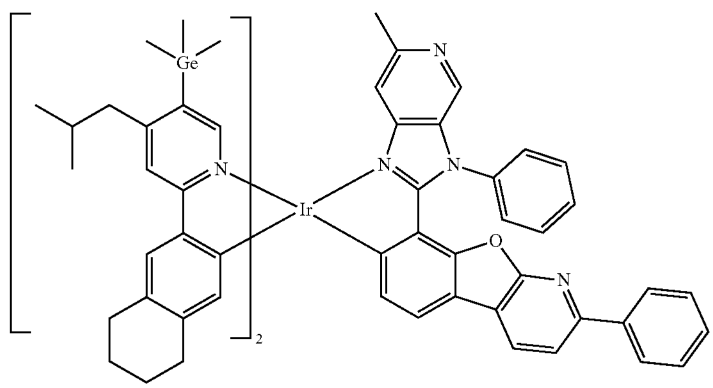
2356
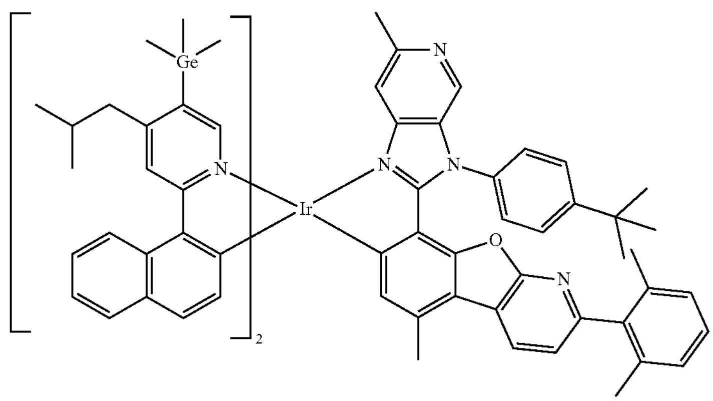
2357
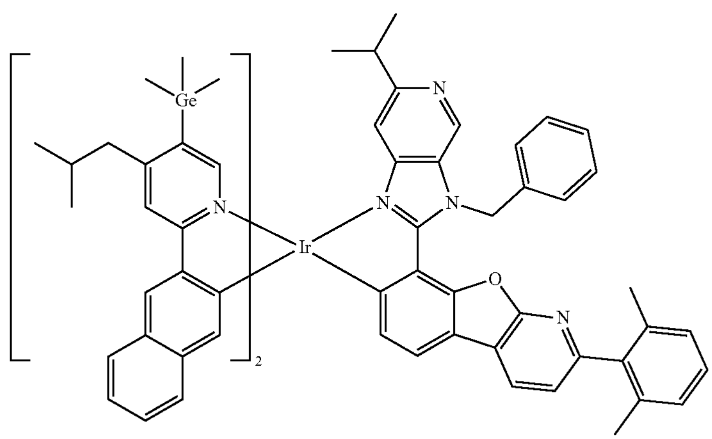
2358
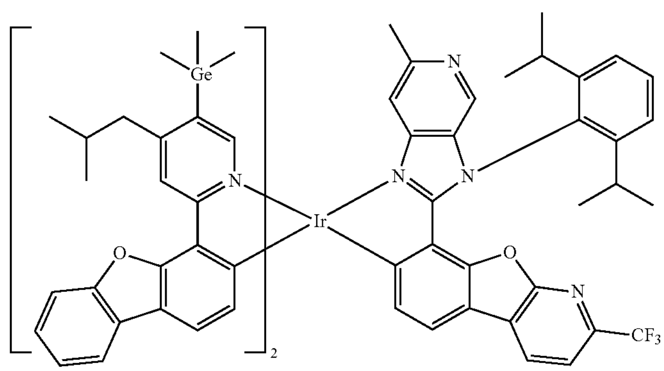

-continued
2359
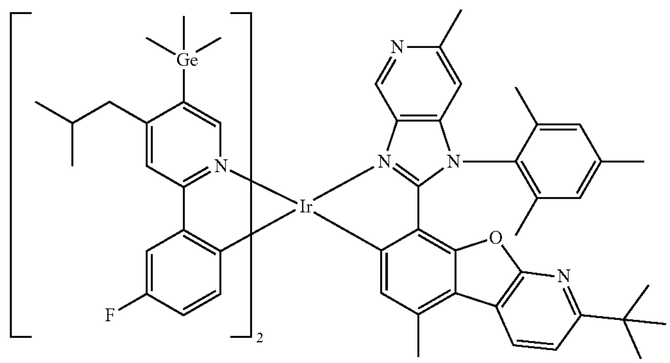
2360
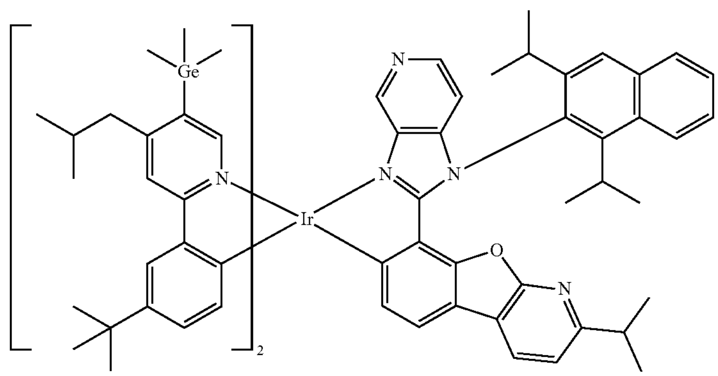
2361
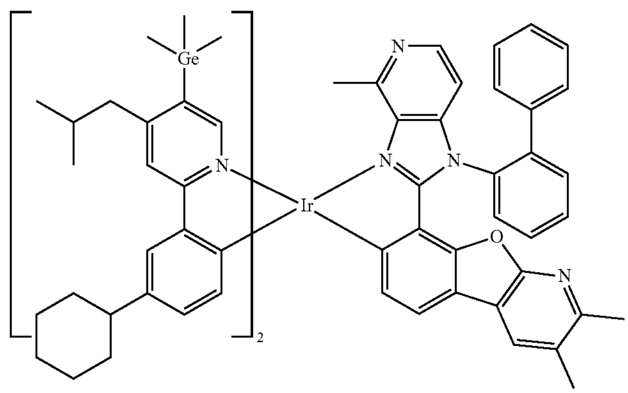
2362
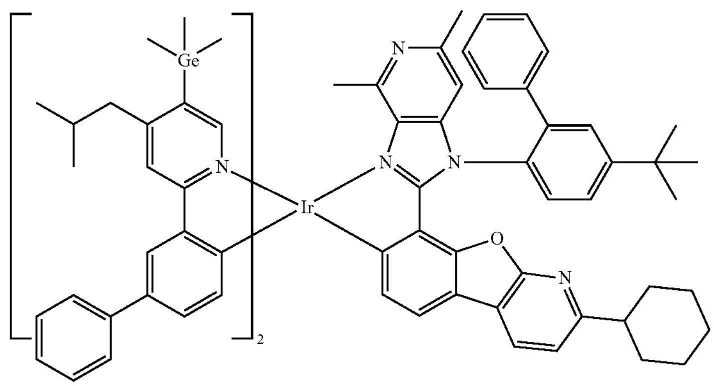

-continued
2363
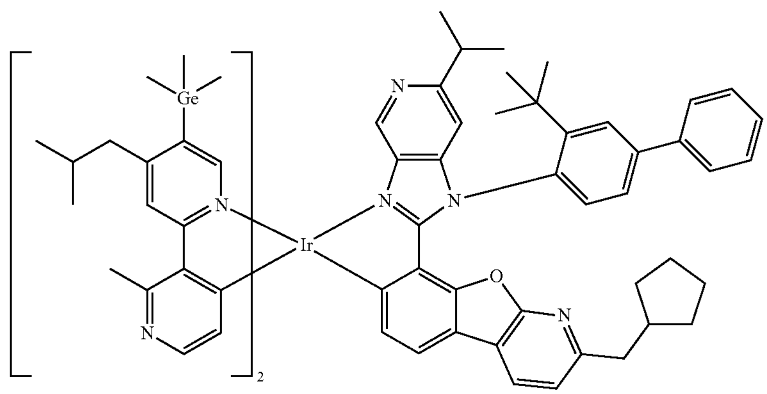
2364
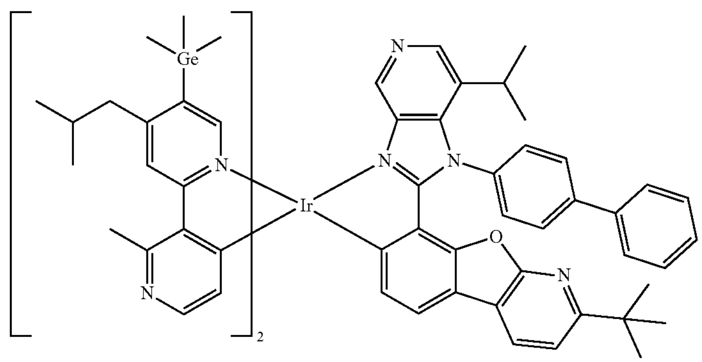
2365
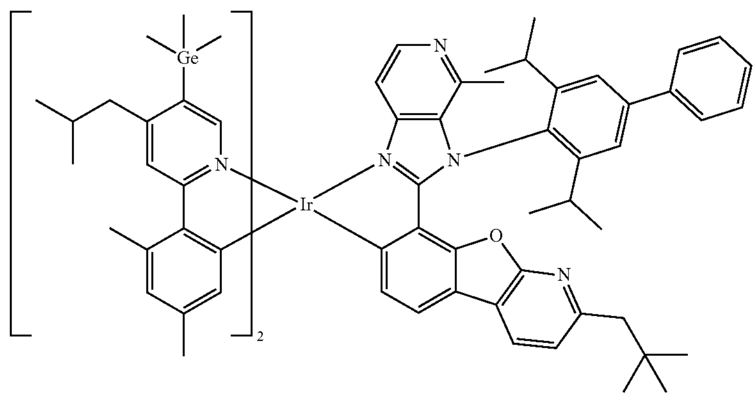
2366
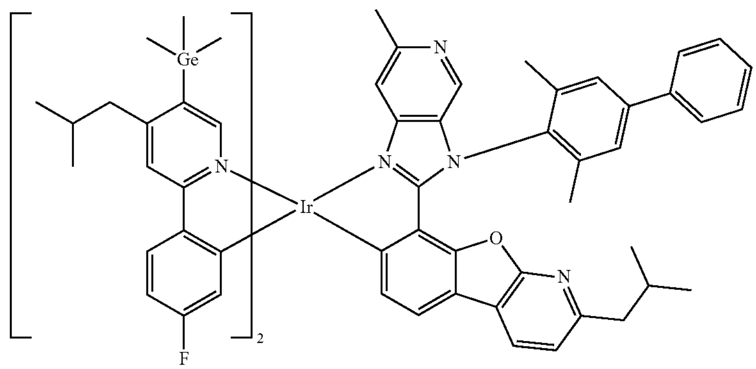

-continued
2367
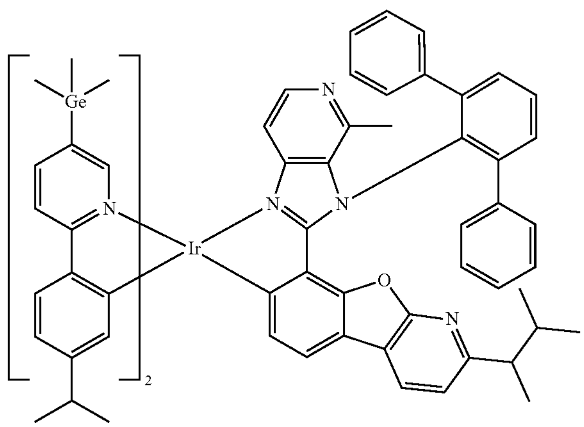
2368
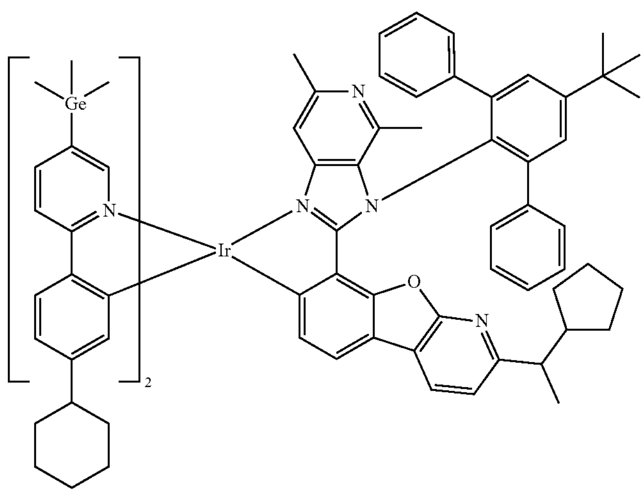
2369
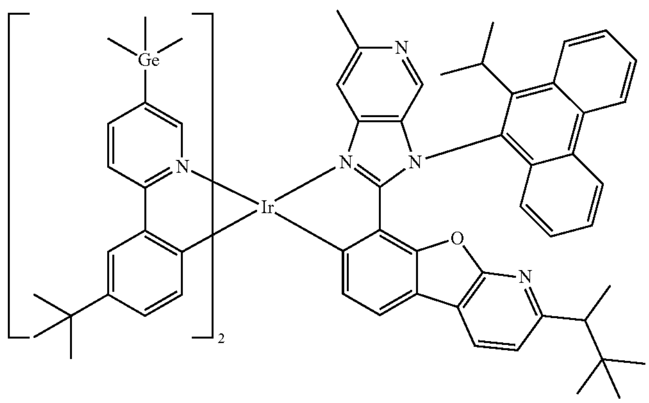

-continued
2370
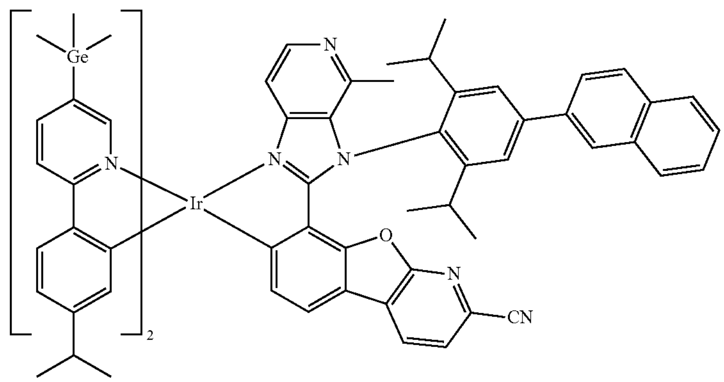
2371
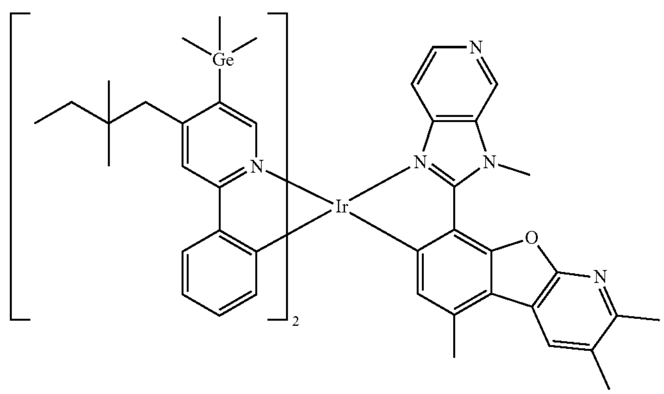
2372
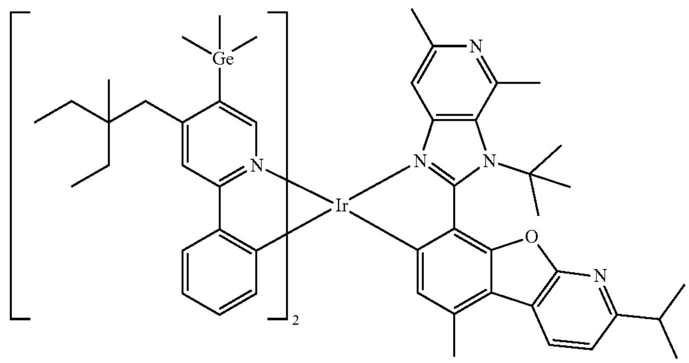
2373
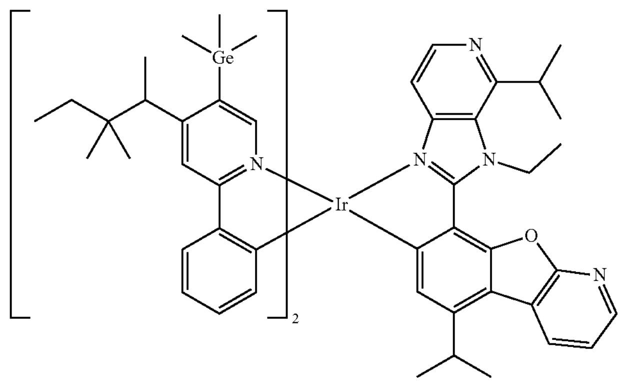

-continued
2374
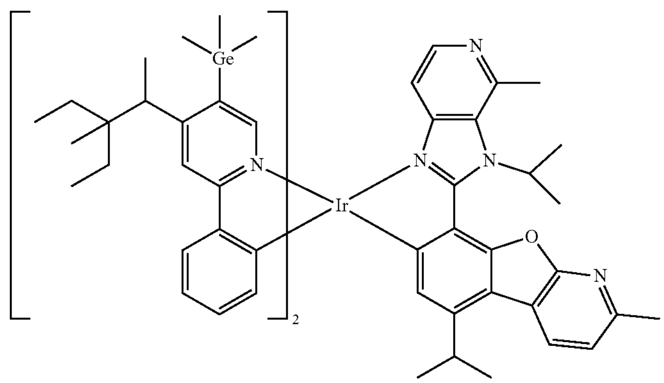
2375
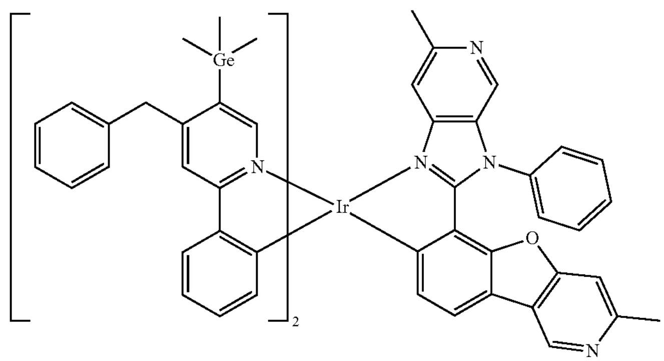
2376
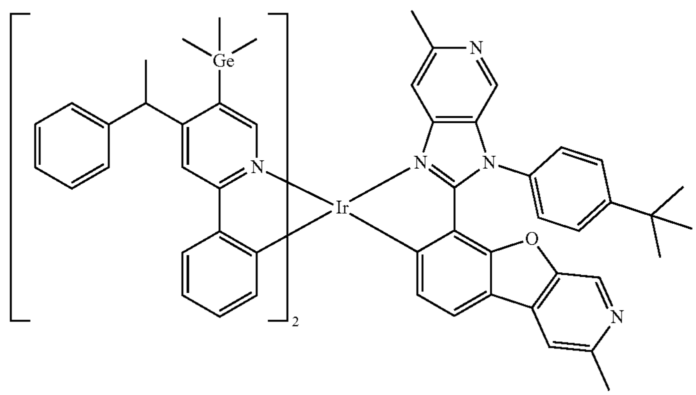
2377
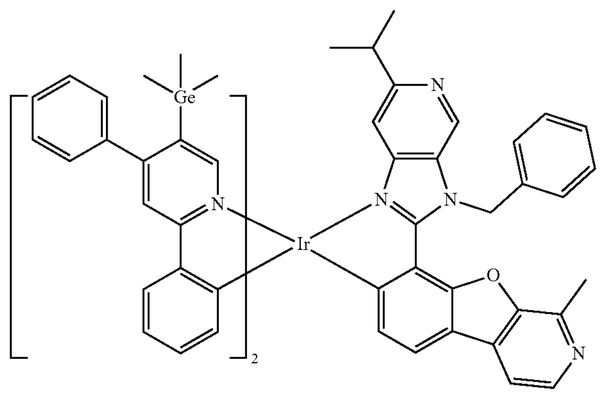

-continued
2378
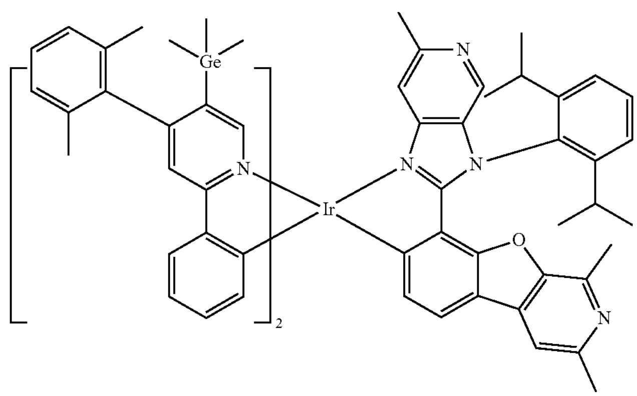
2379
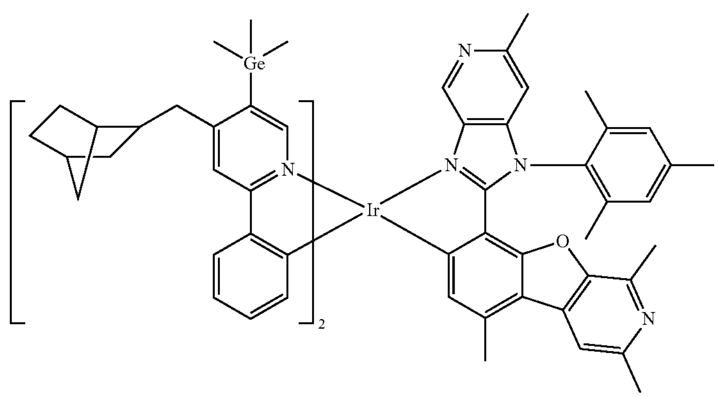
2380
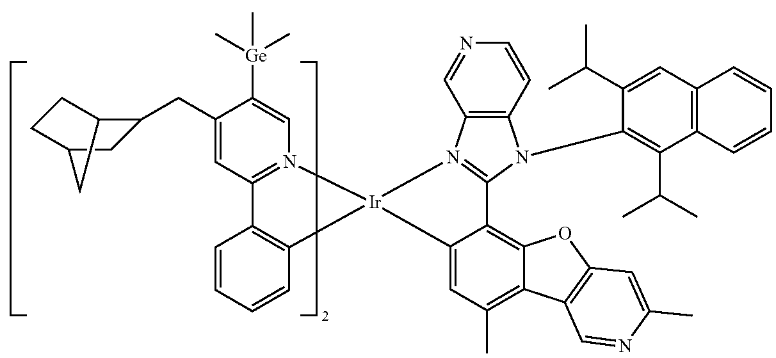
2381
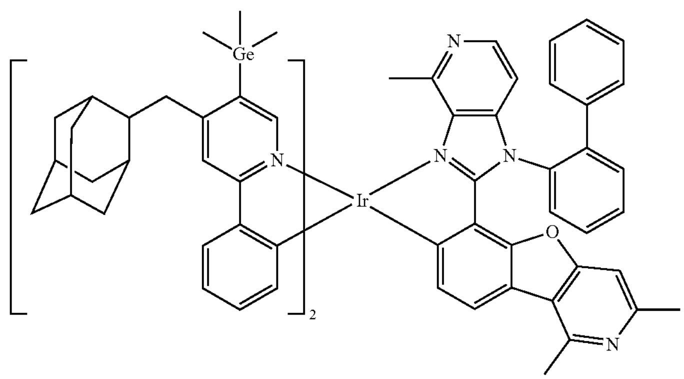

-continued
2382
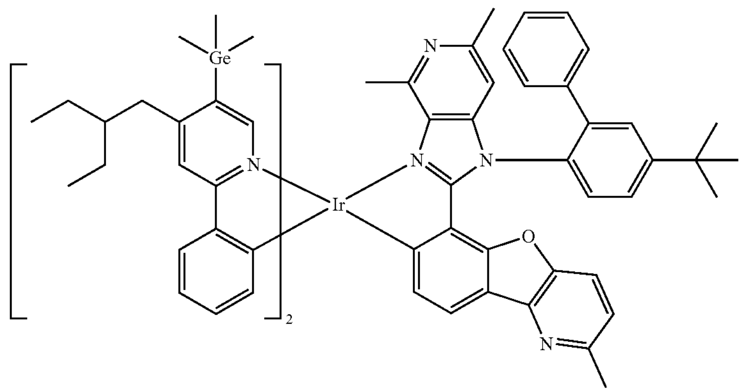
2383
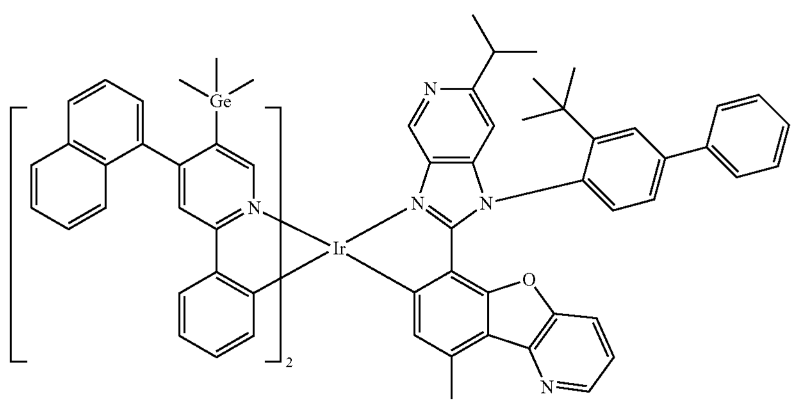
2384
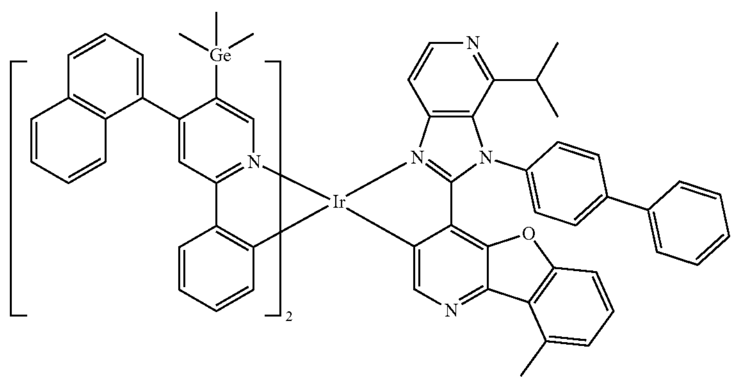
2385
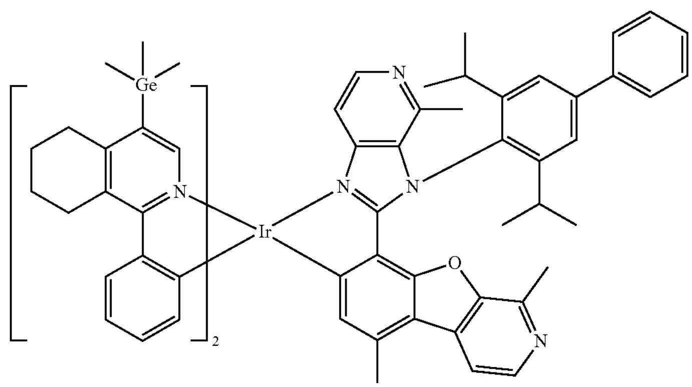

-continued
2386
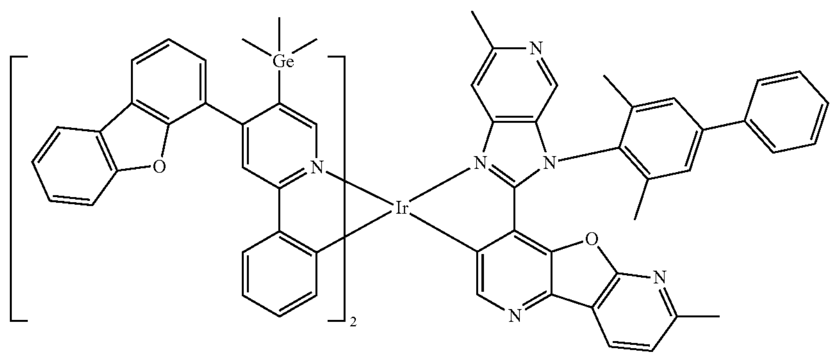
2387
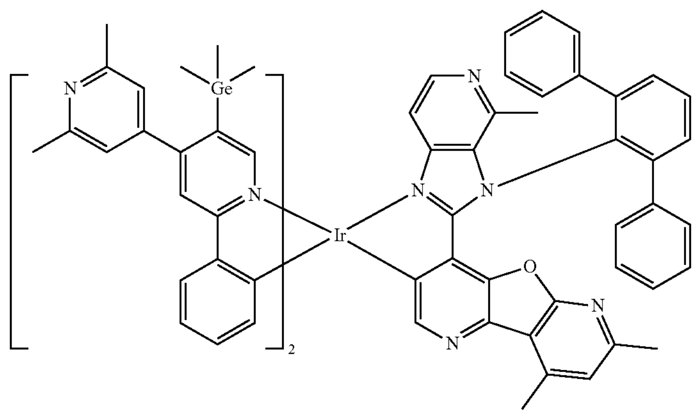
2388
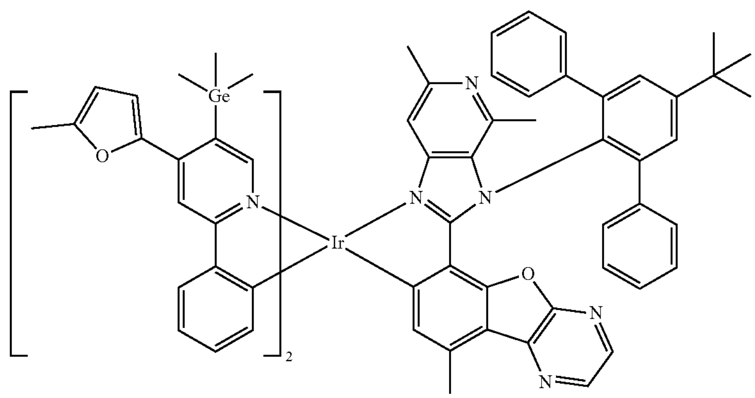
2389
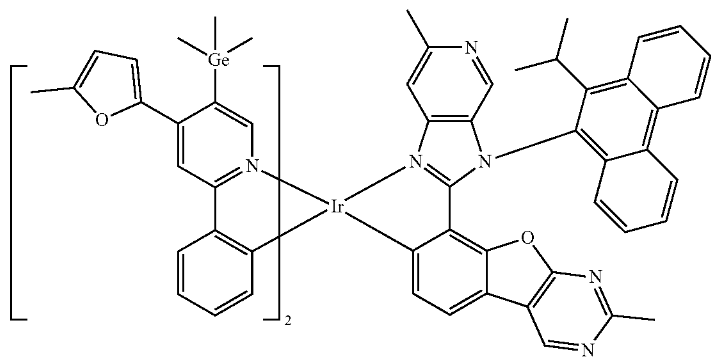

-continued
2390
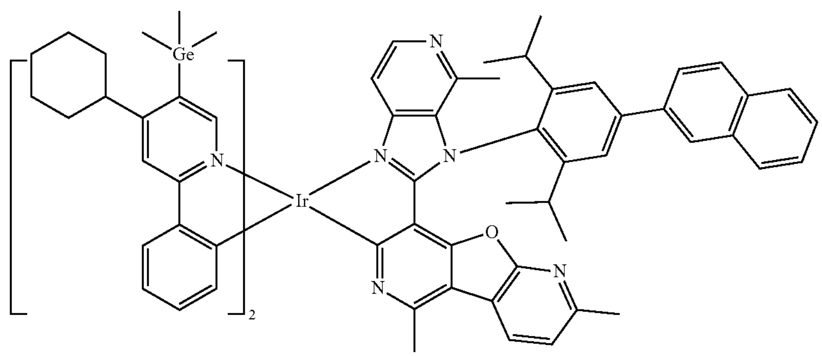
2391
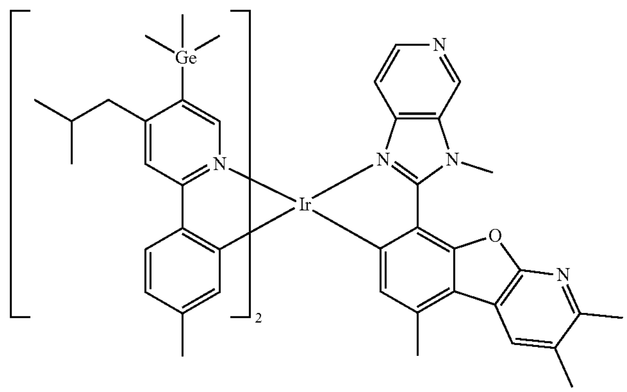
2392
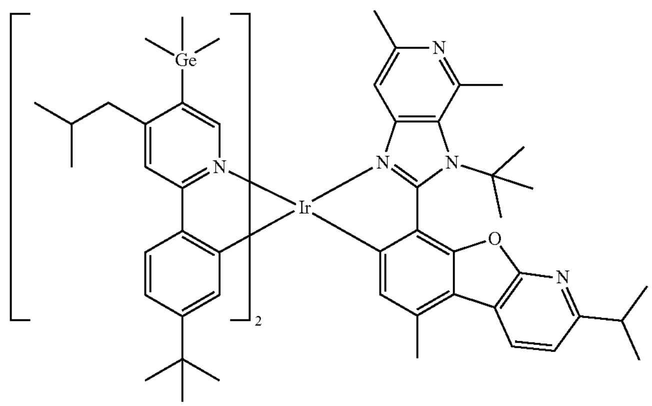
2393
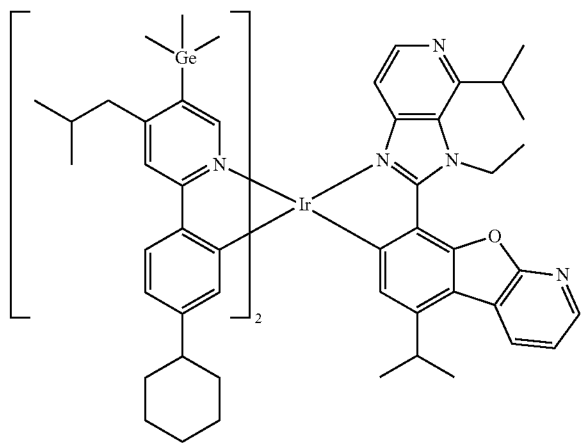

-continued
2394
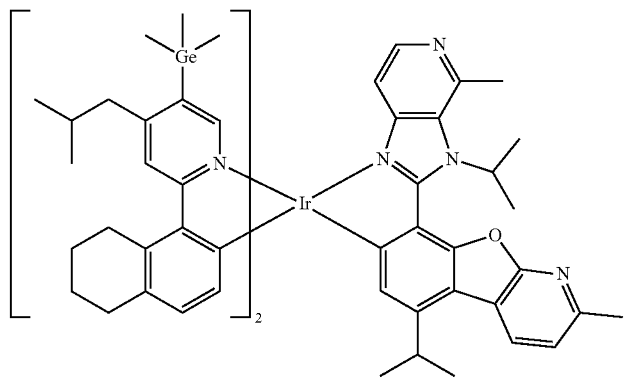
2395
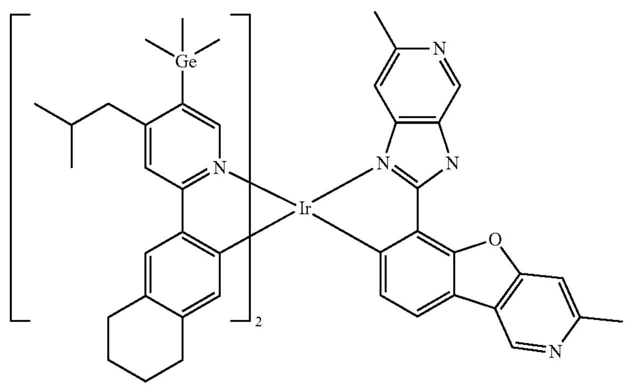
2396
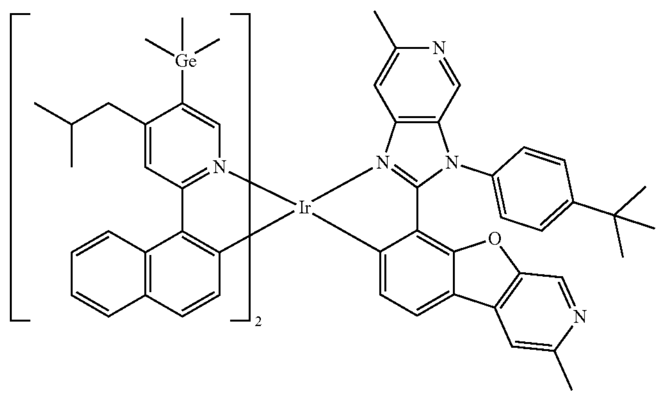
2397
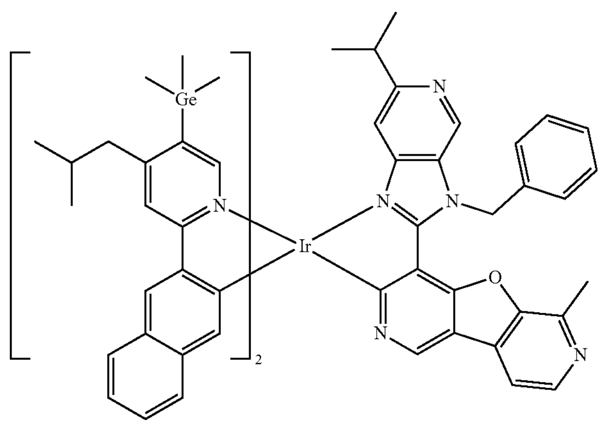

-continued
2398
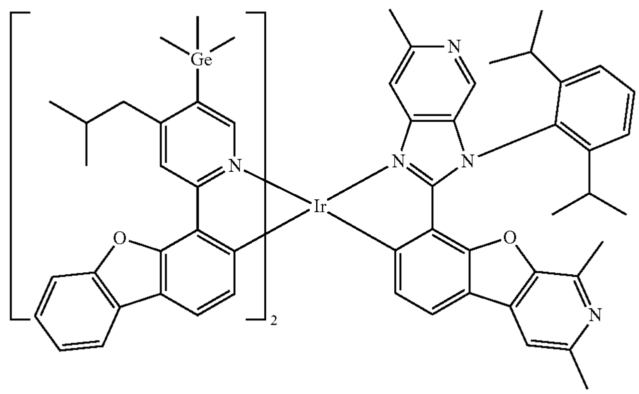
2399
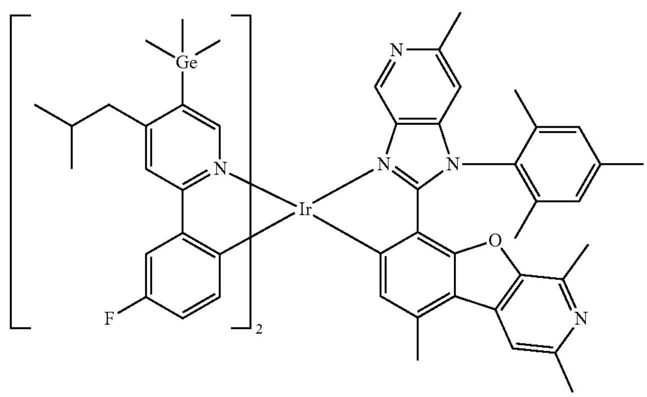
2400
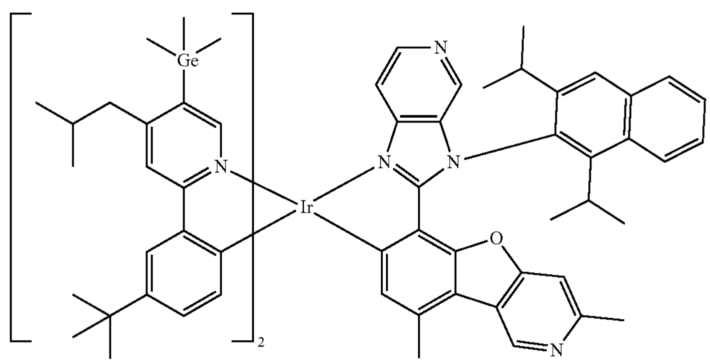
2401
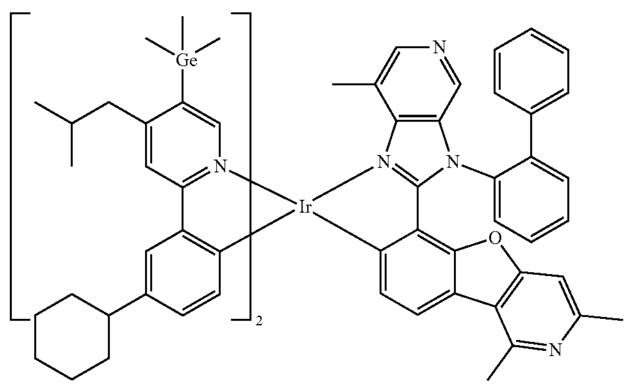

-continued
2402
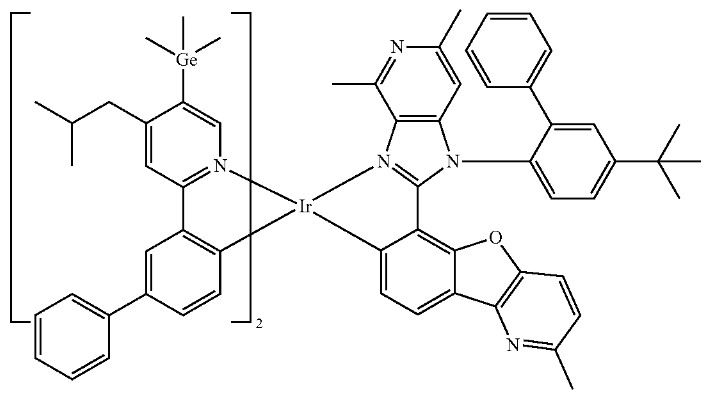
2403
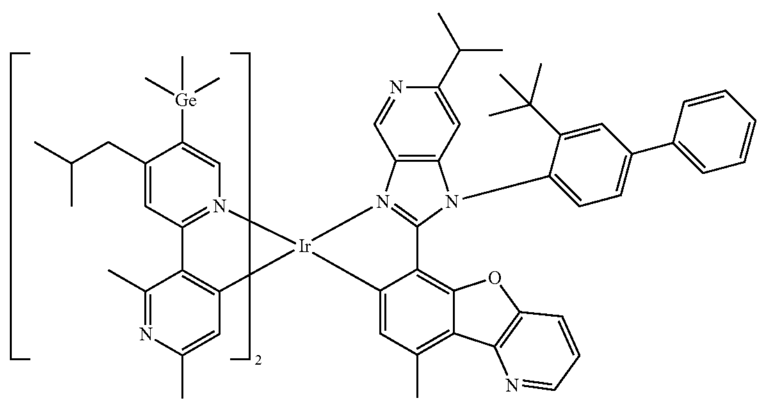
2404
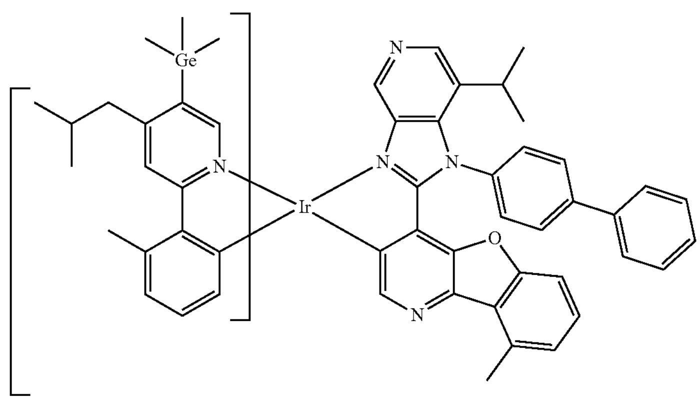
2405
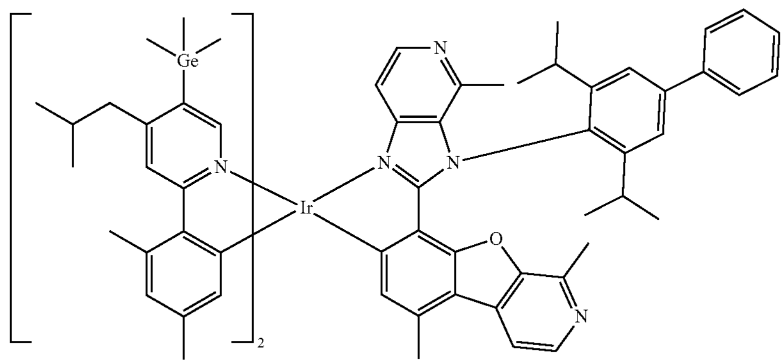

-continued
2406
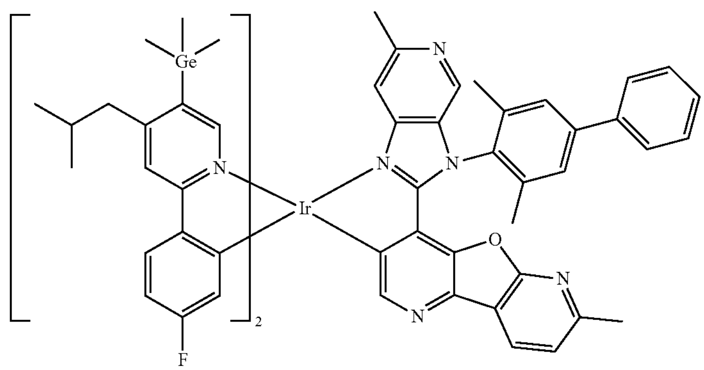
2407
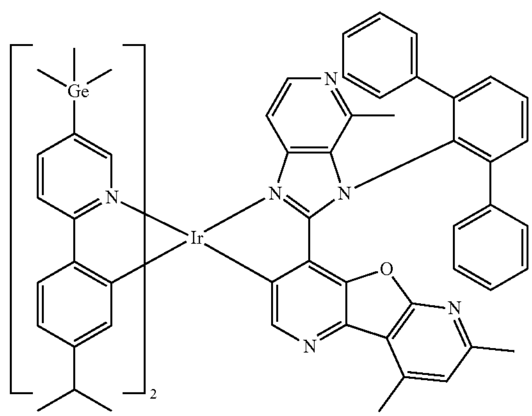
2408
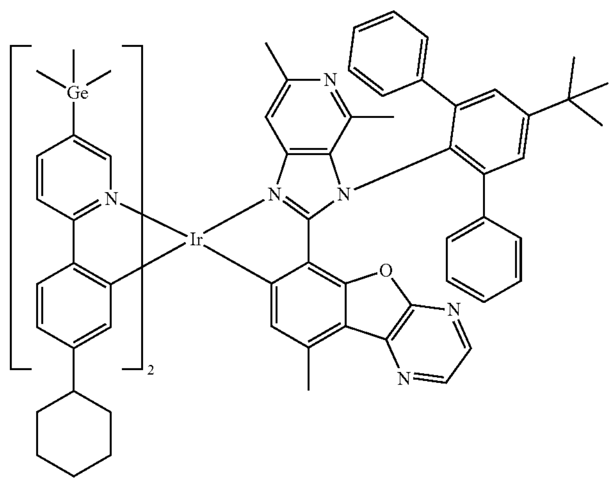
2409
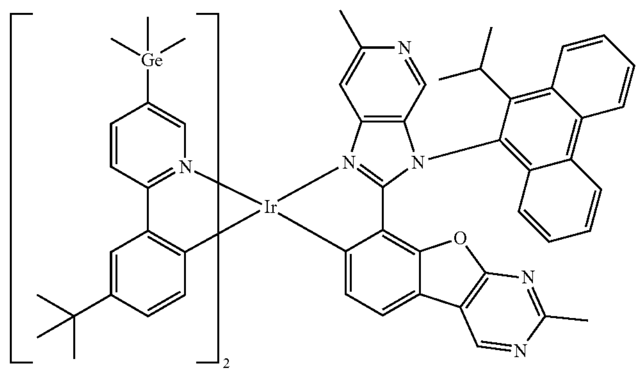

-continued
2410
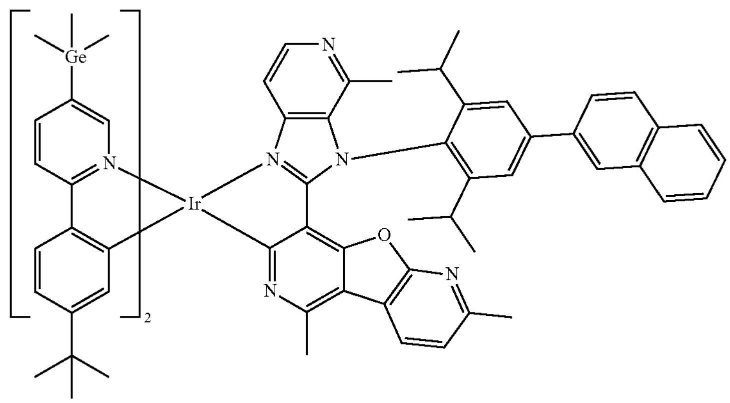
2411
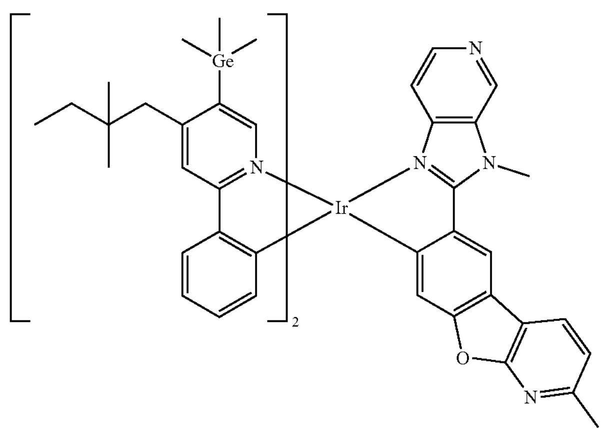
2412
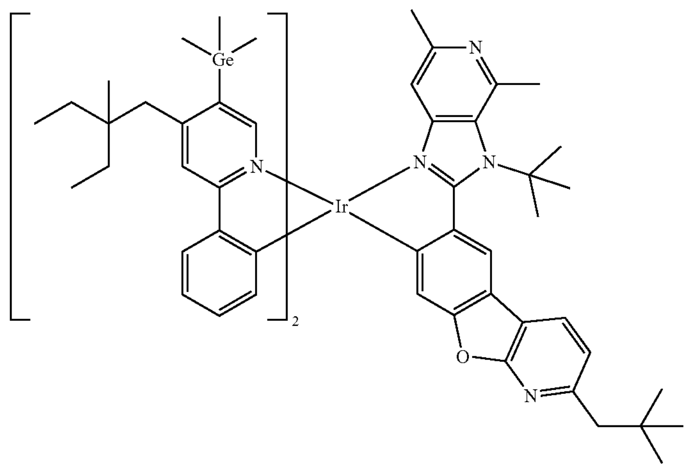

-continued
2413
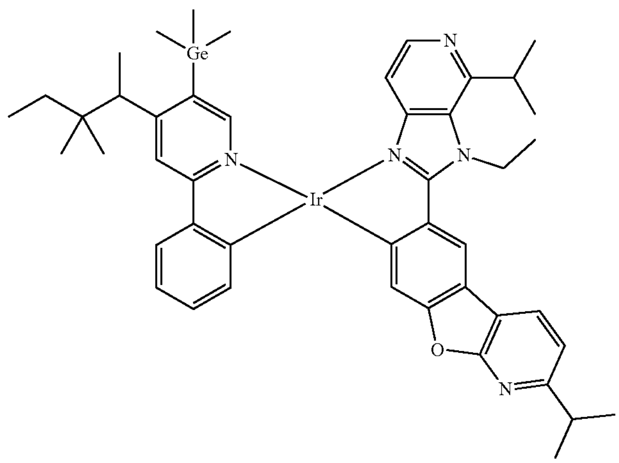
2414
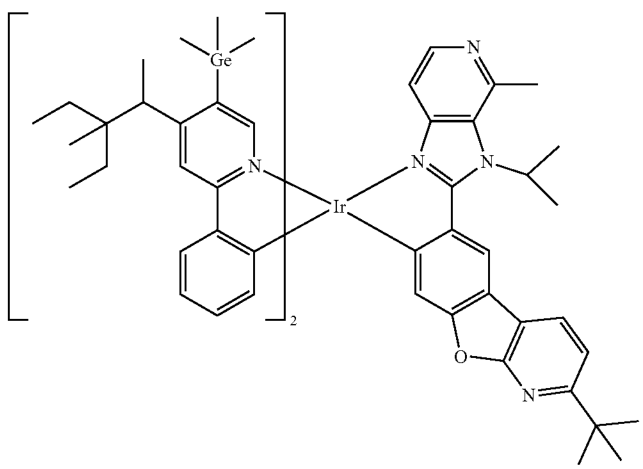
2415
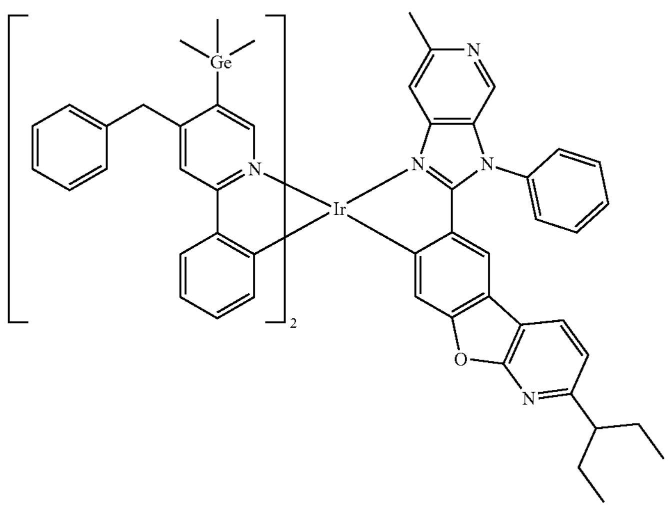

-continued
2416
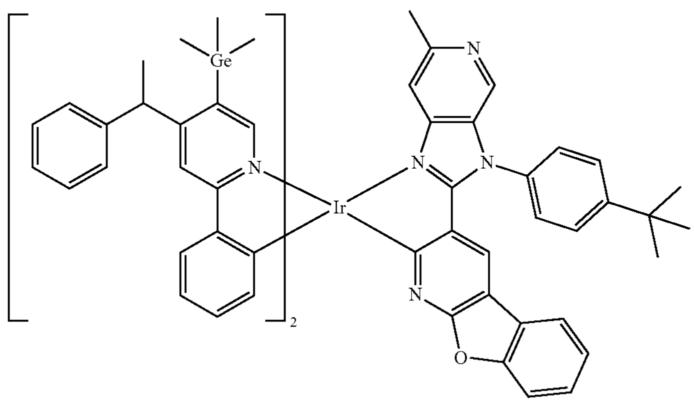
2417
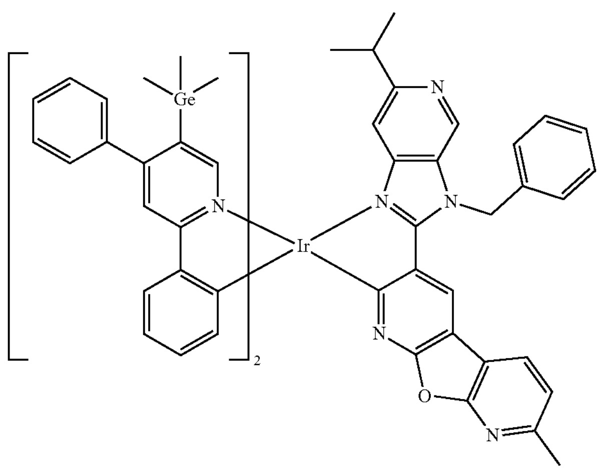
2418
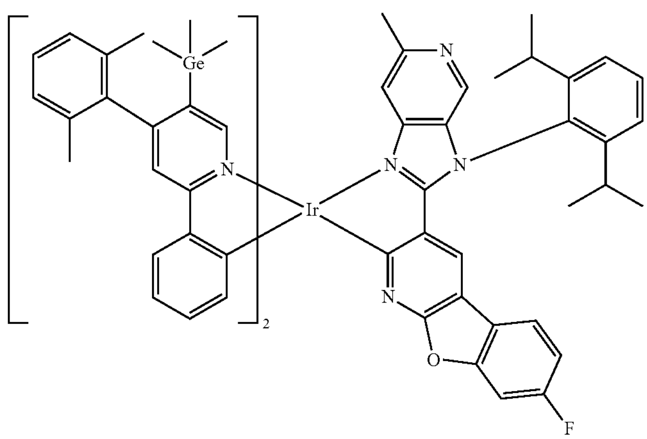

-continued
2419
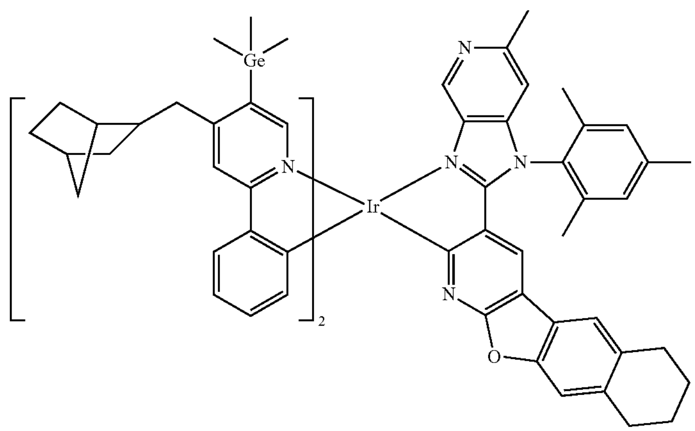
2420
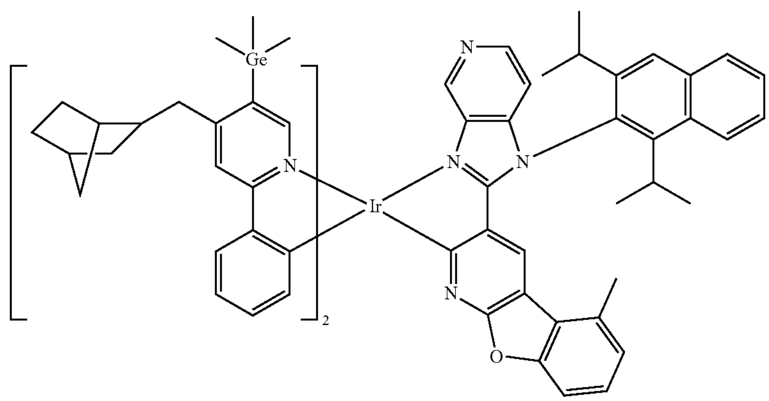
2421
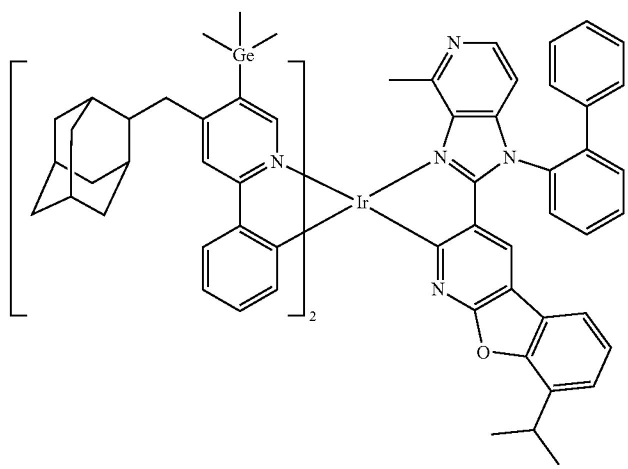

-continued
2422
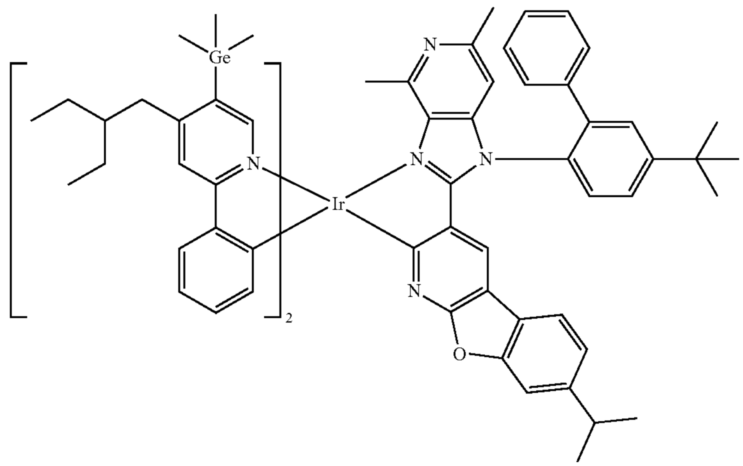
2423
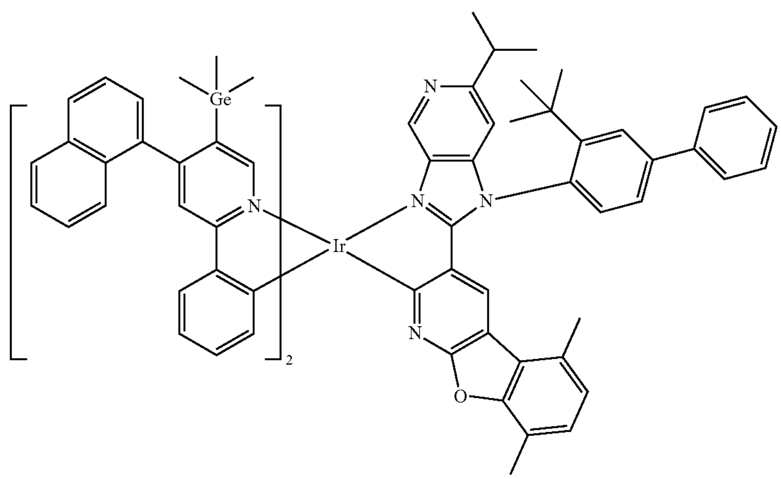
2424
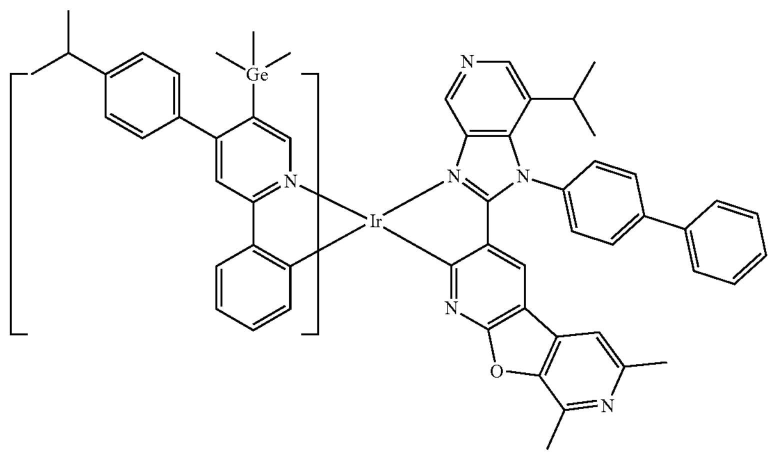

-continued
2425
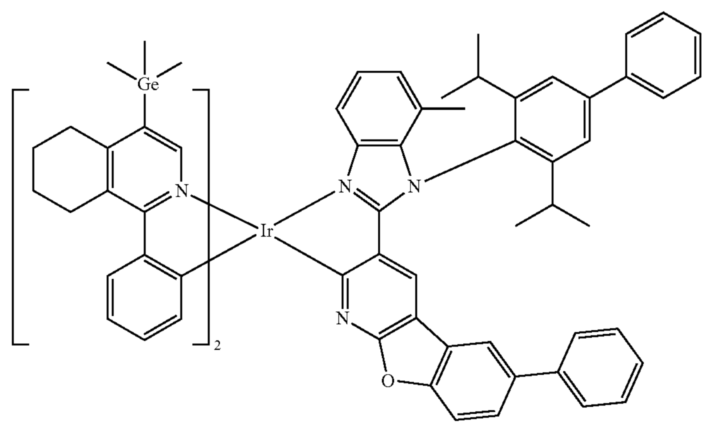
2426
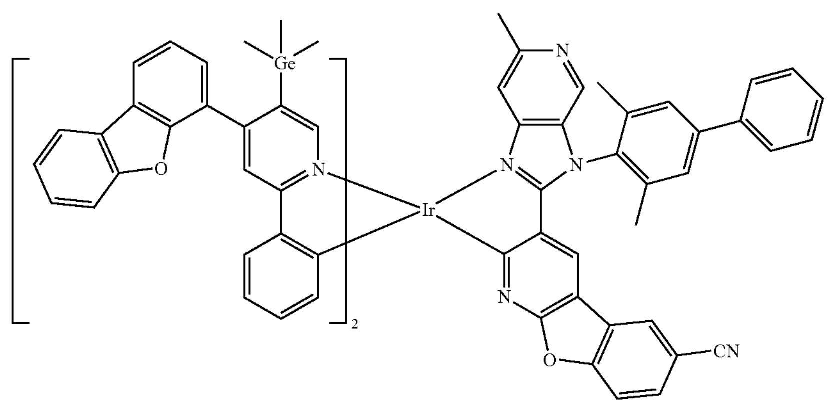
2427
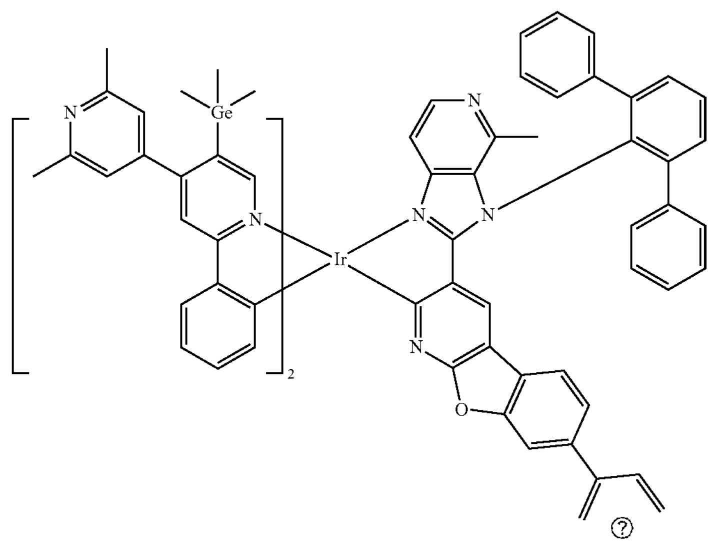

-continued
2428
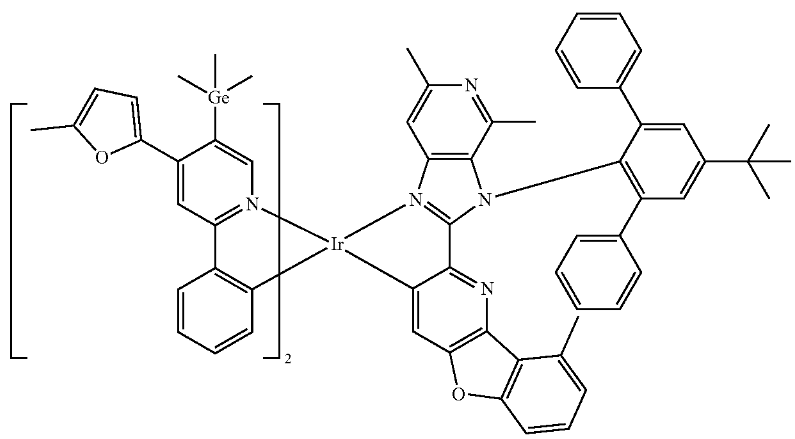
2429
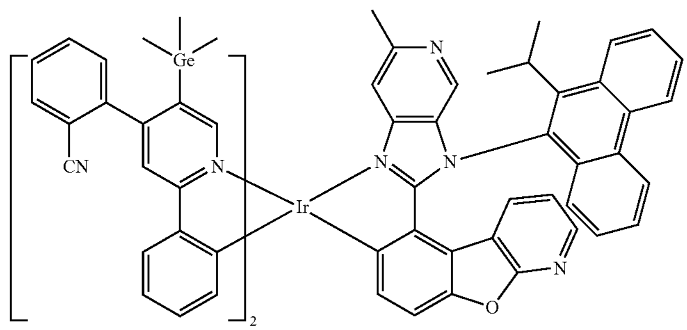
2430
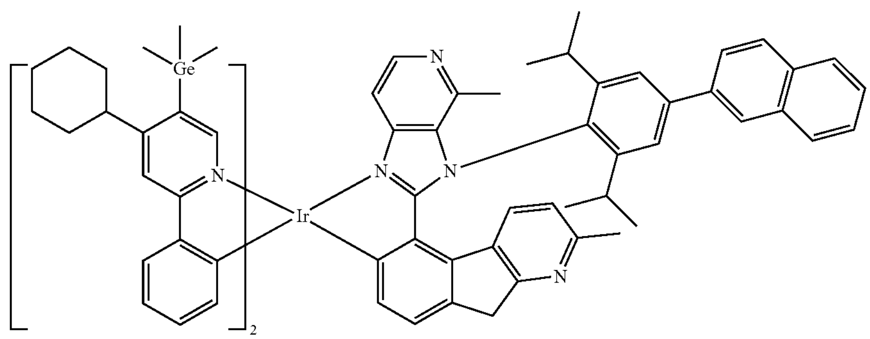
2431
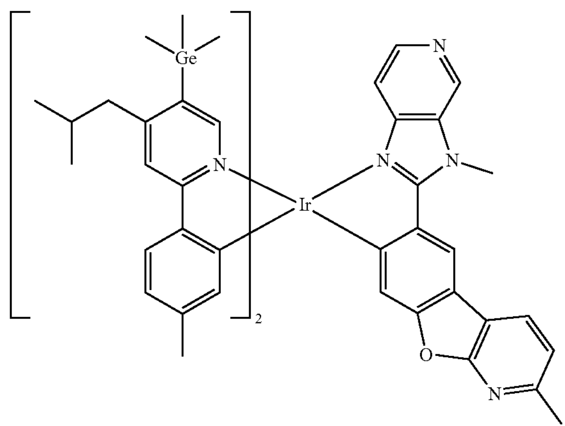

-continued
2432
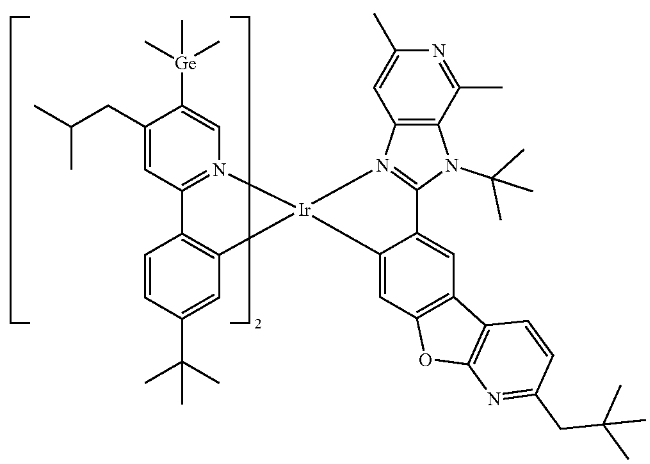
2433
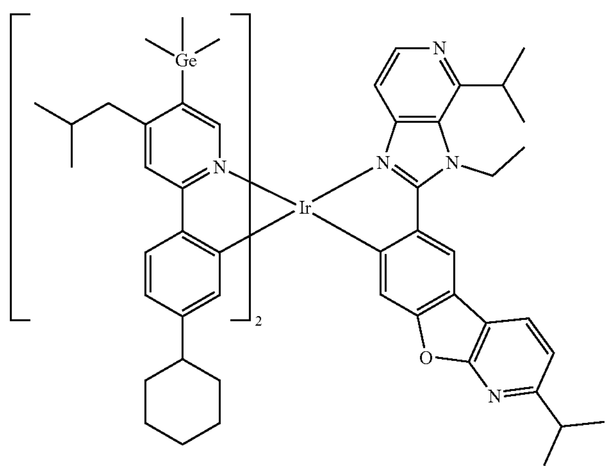
2434
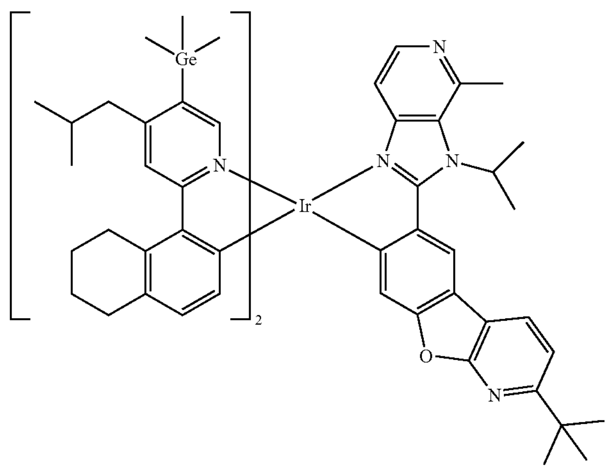

-continued
2435
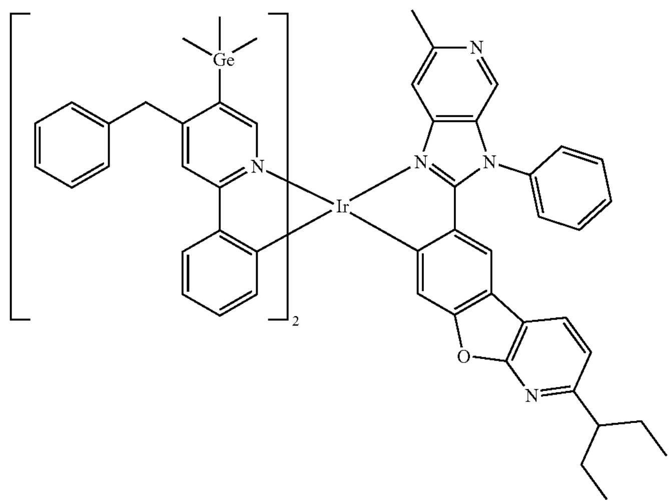
2436
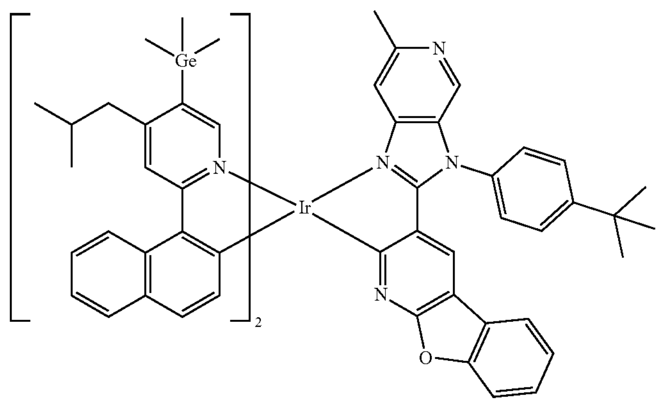
2437
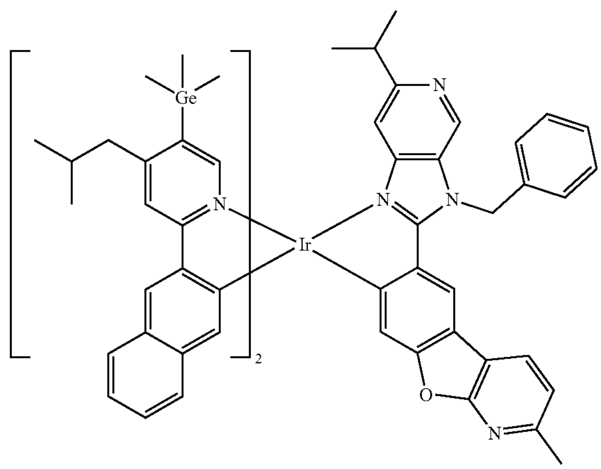

-continued
2438
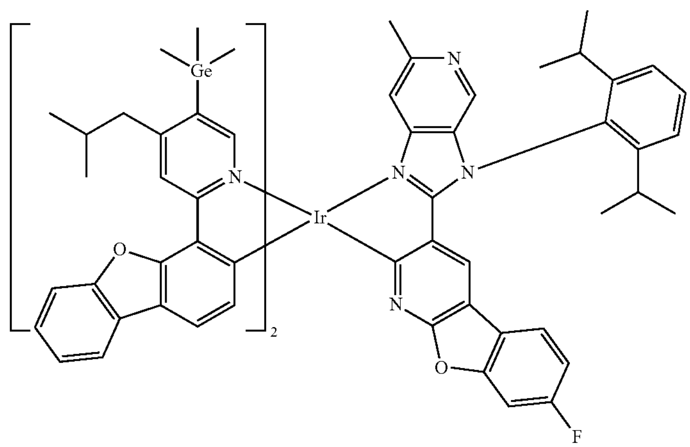
2439
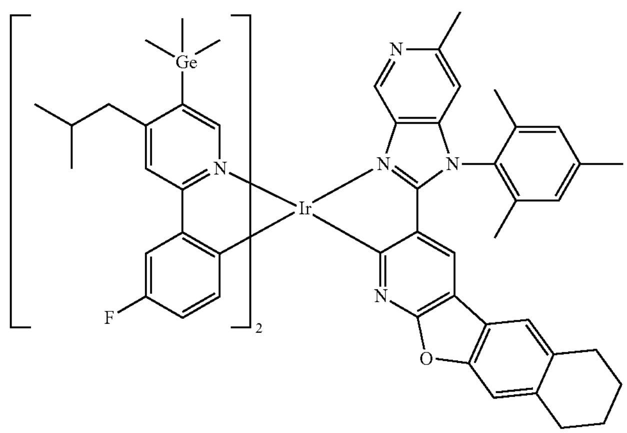
2440
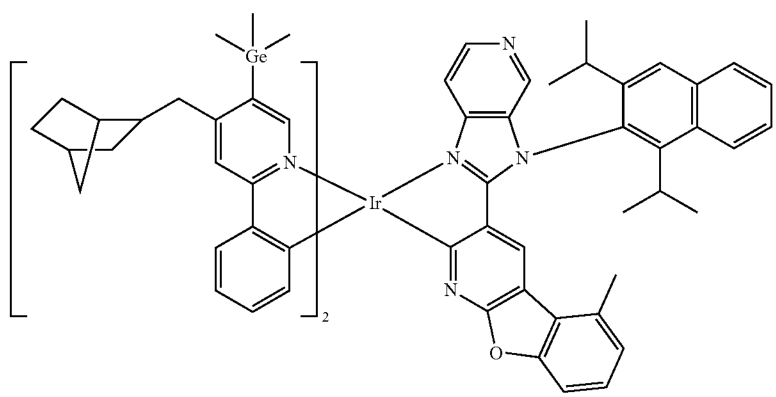

-continued
2441
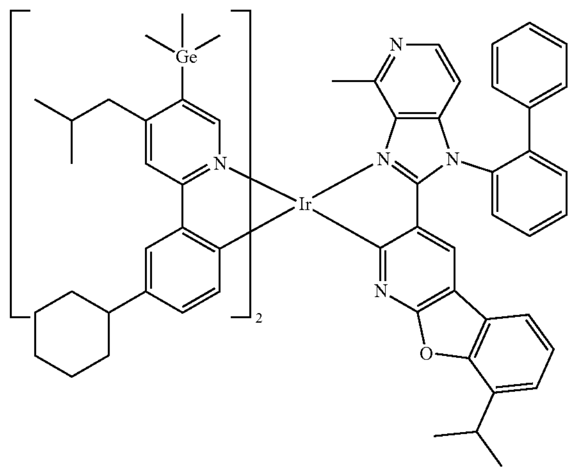
2442
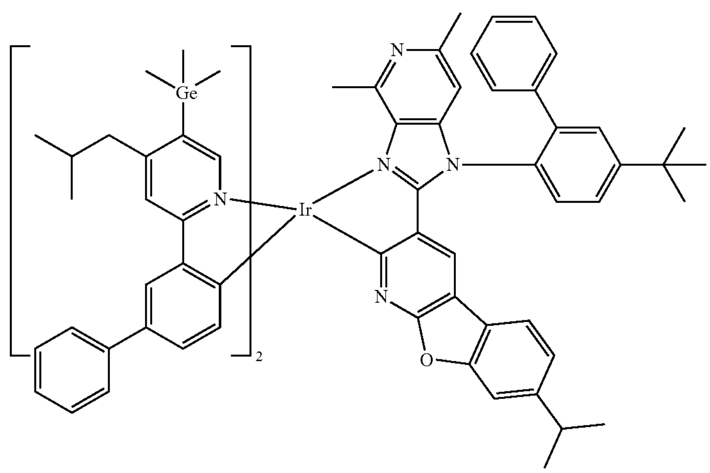
2443
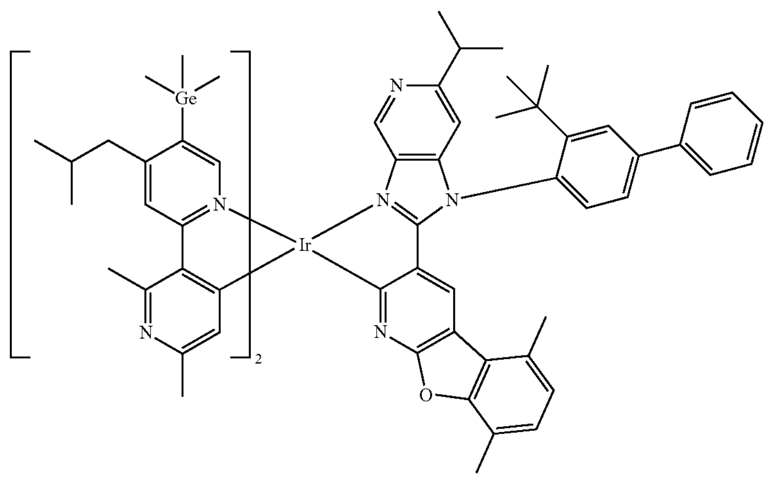

-continued
2444
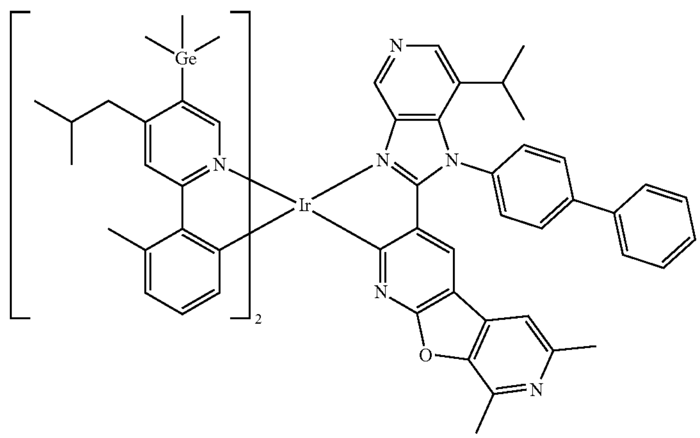
2445
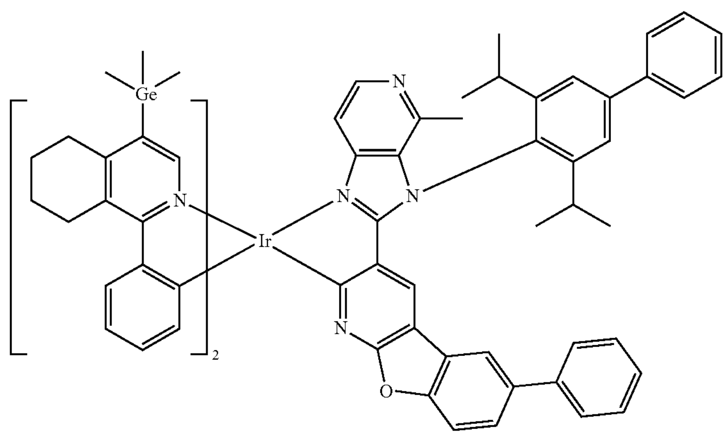
2446
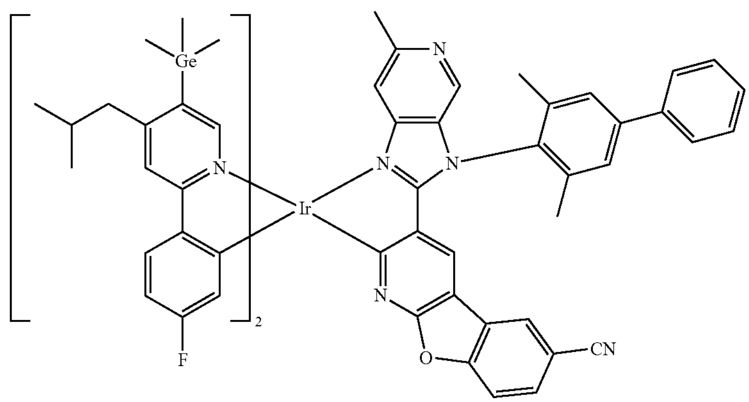

-continued
2447
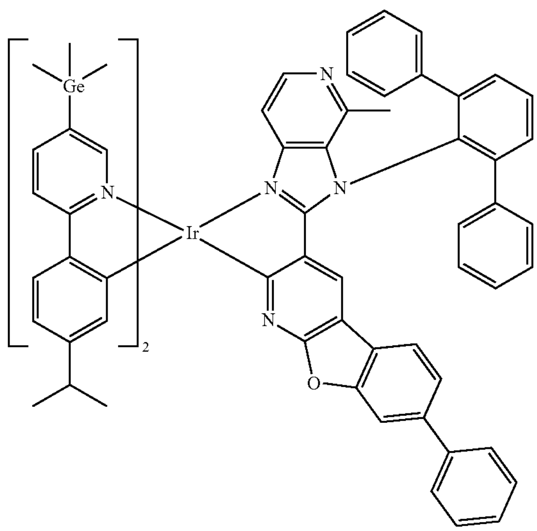
2448
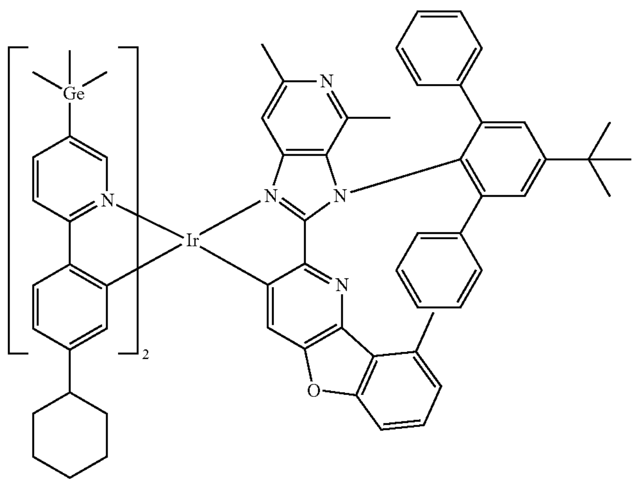
2449
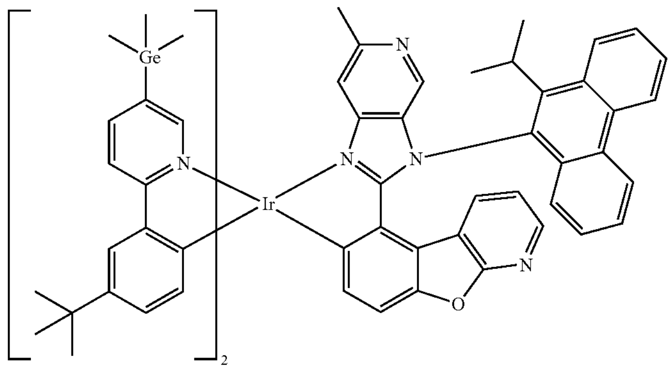

-continued
2450
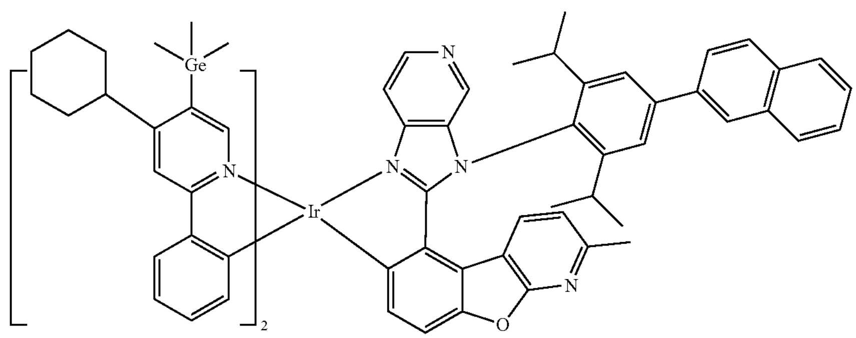
2451
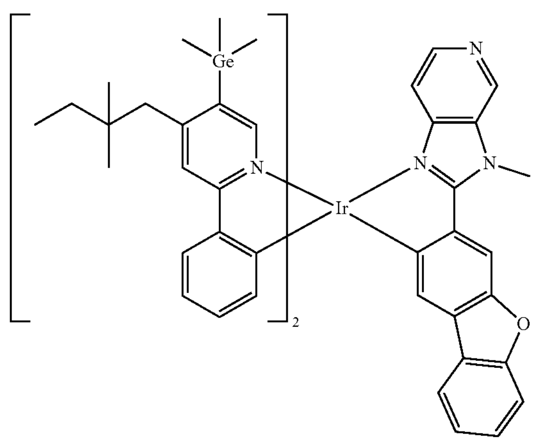
2452
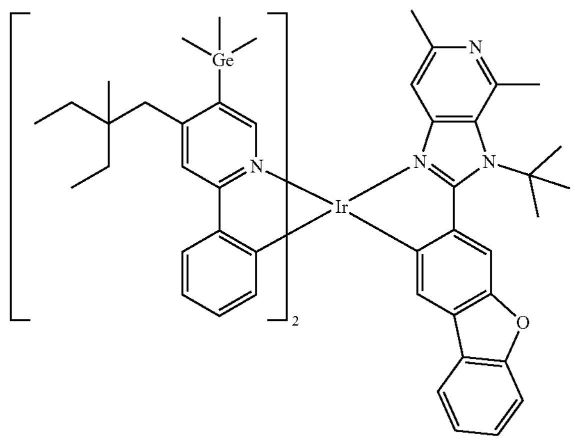

-continued
2453
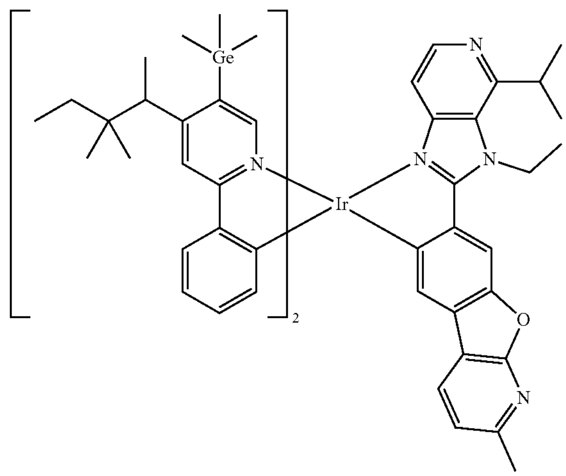
2454
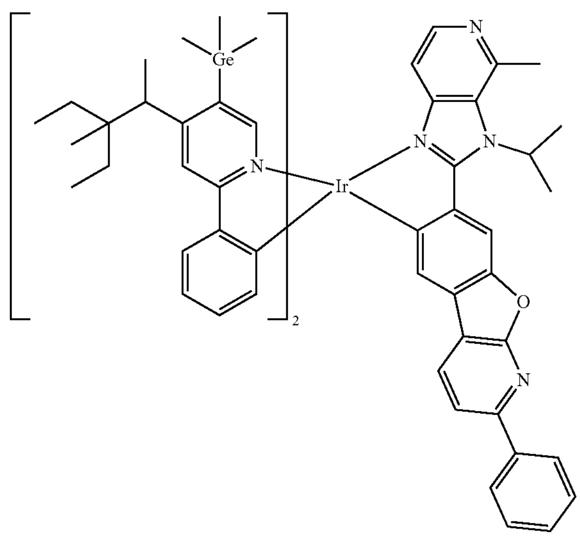
2455
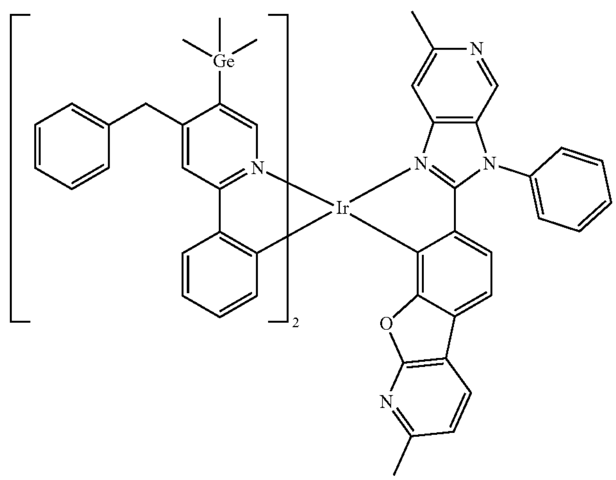

-continued
2456
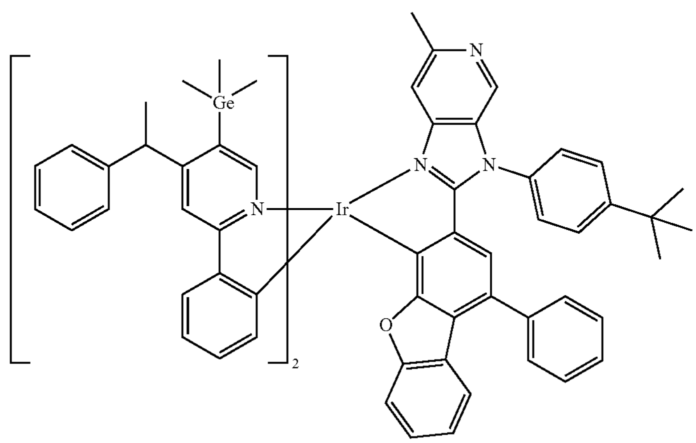
2457
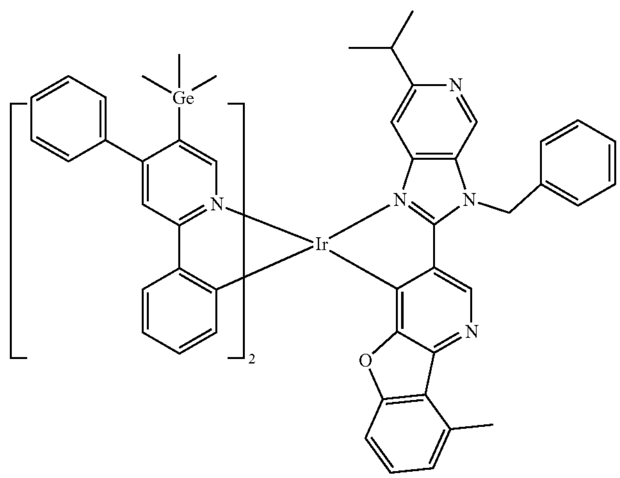
2458
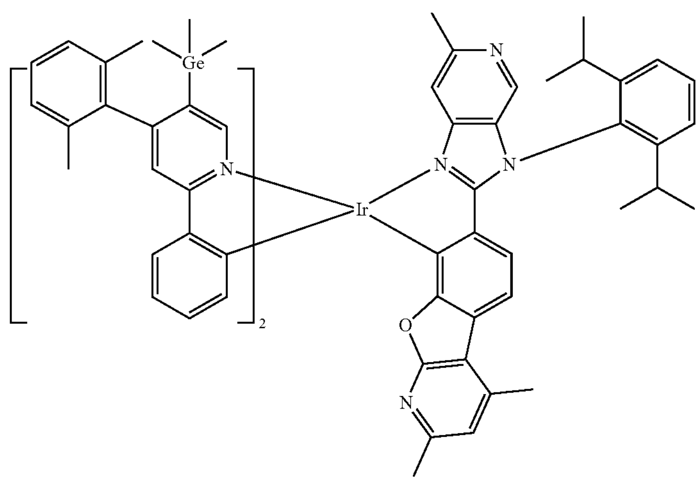

-continued
2459
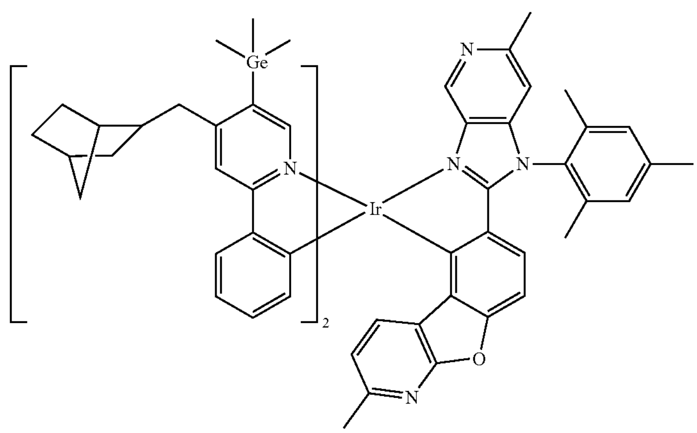
2460
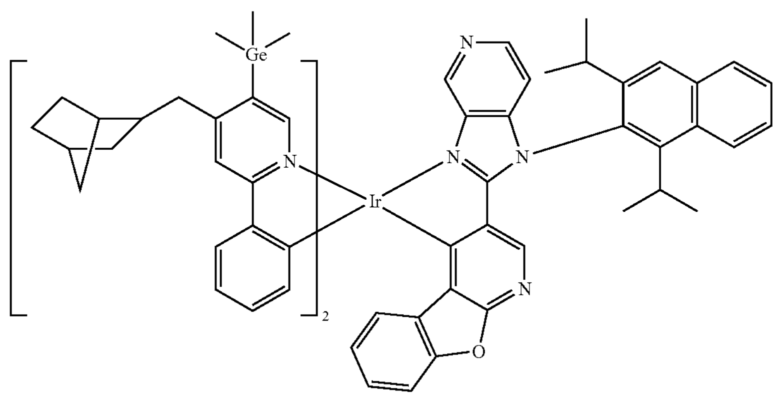
2461
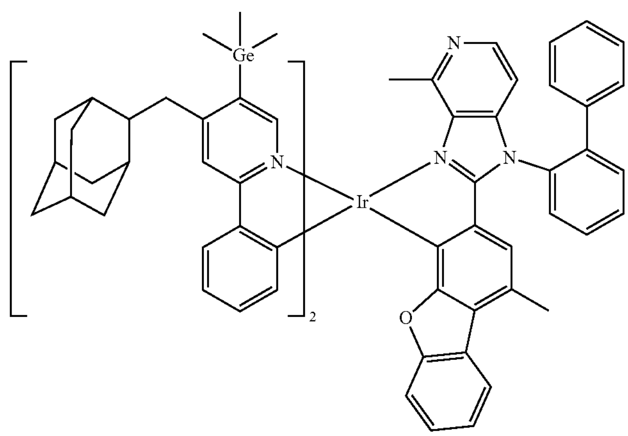

-continued
2462
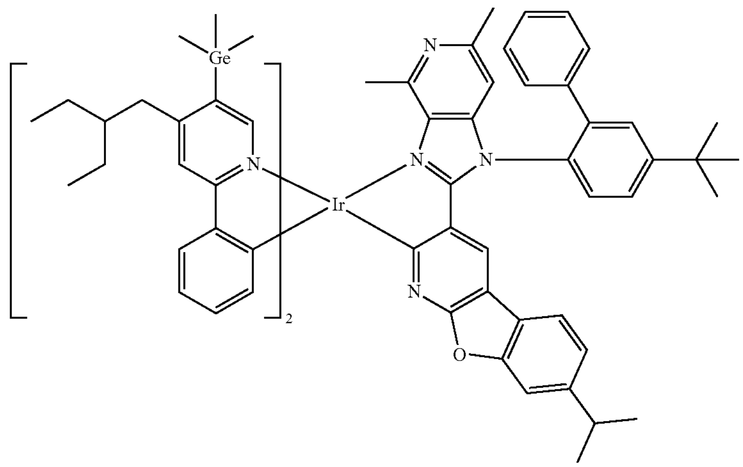
2463
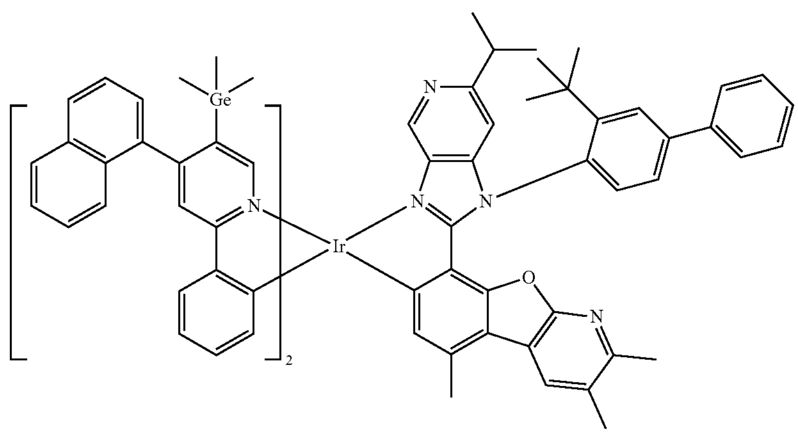
2464
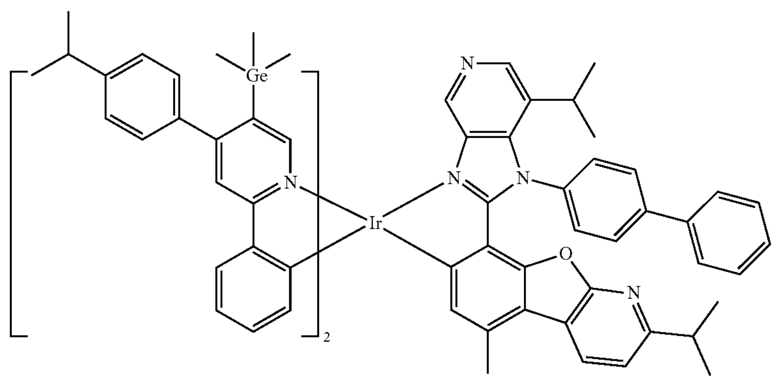

-continued
2465
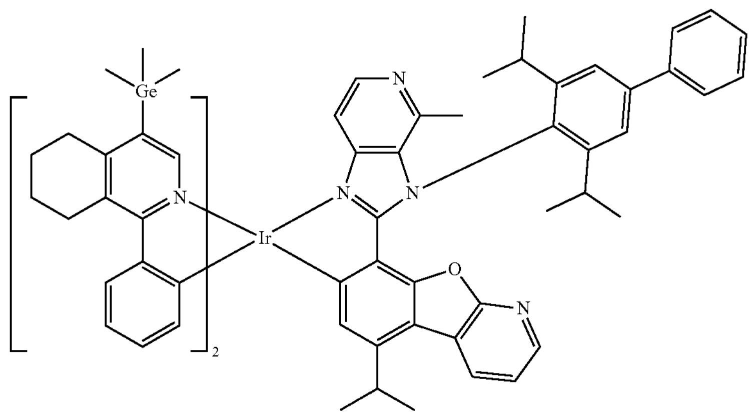
2466
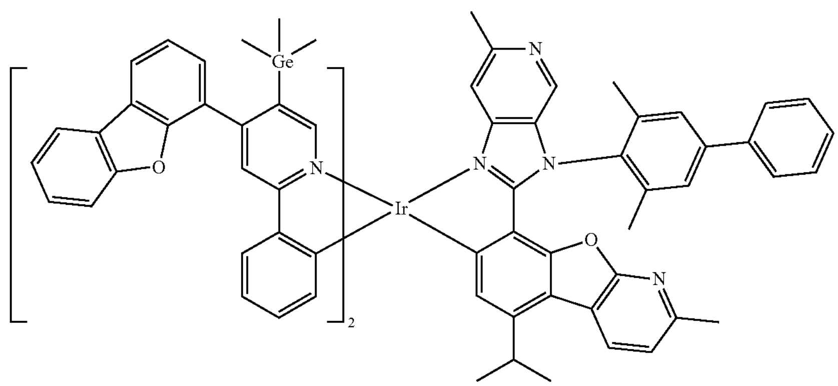
2467
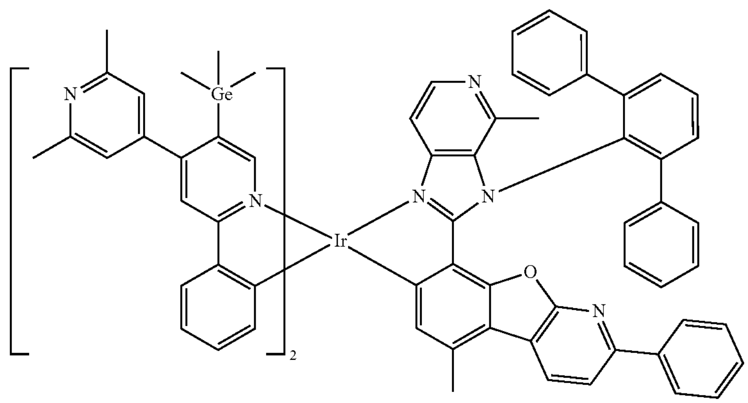
2468
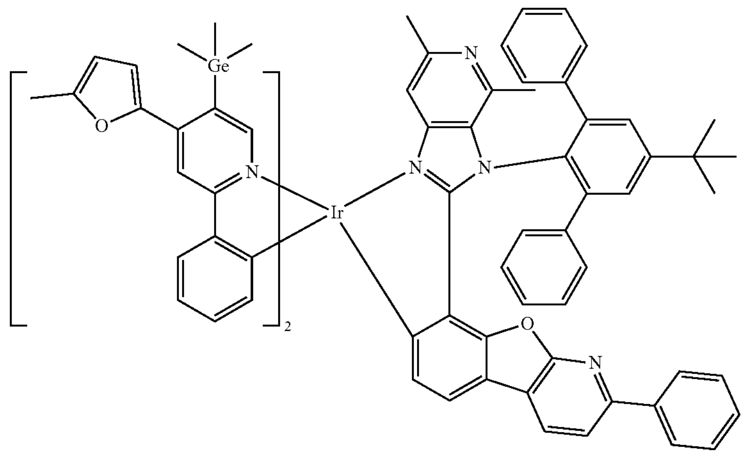

-continued
2469
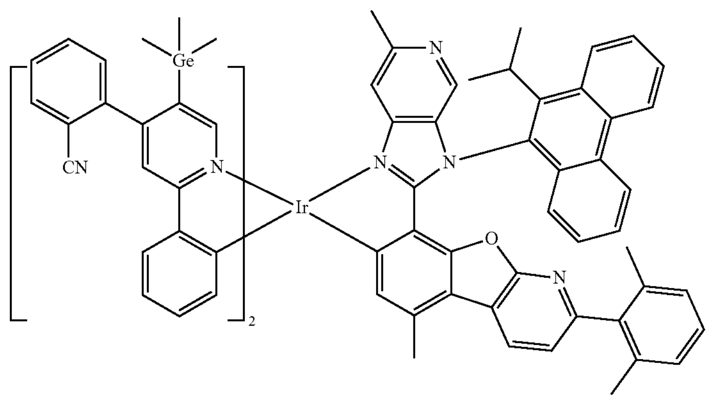
2470
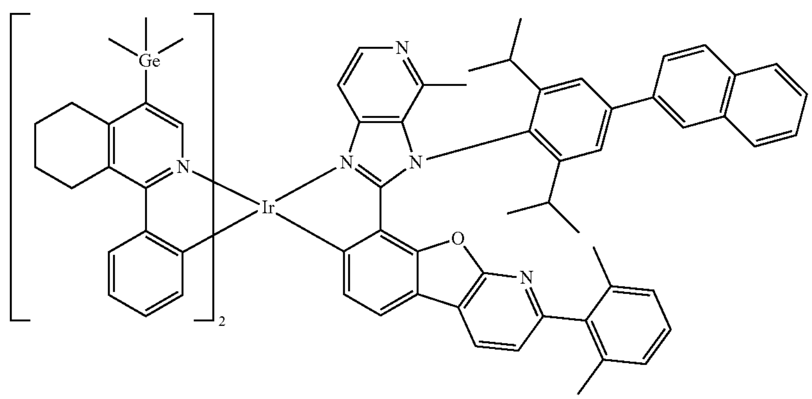
2471
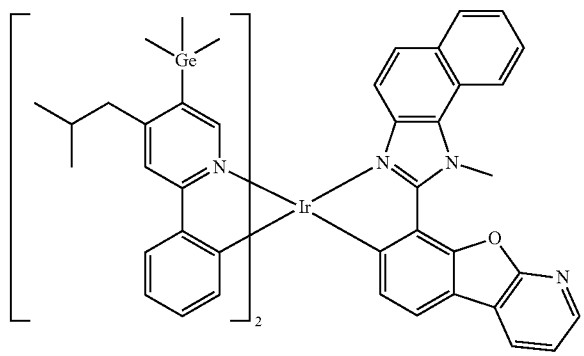
2472
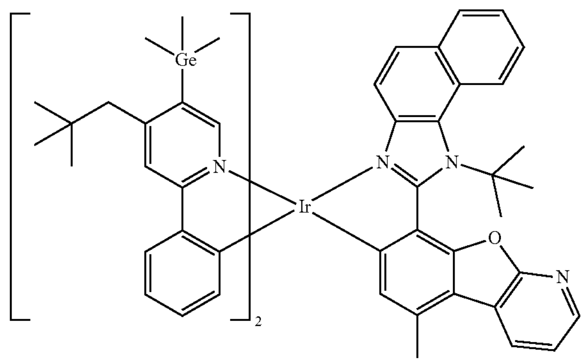

-continued
2473
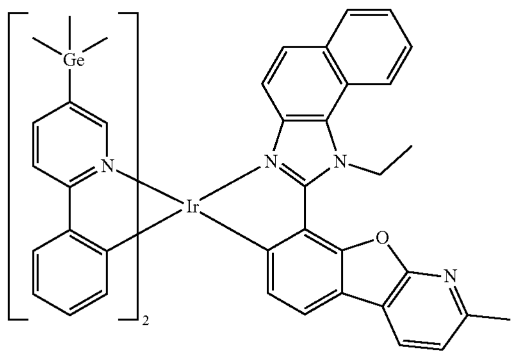
2474
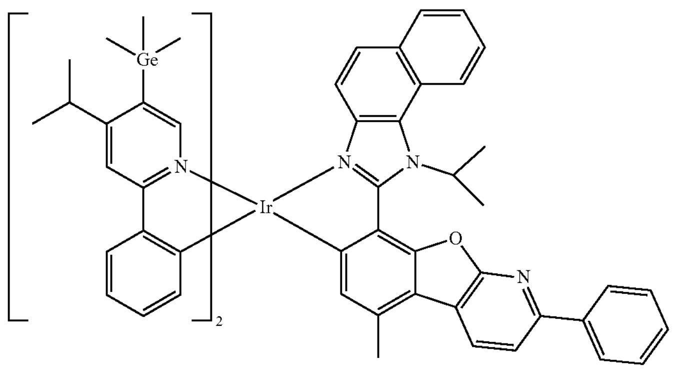
2475
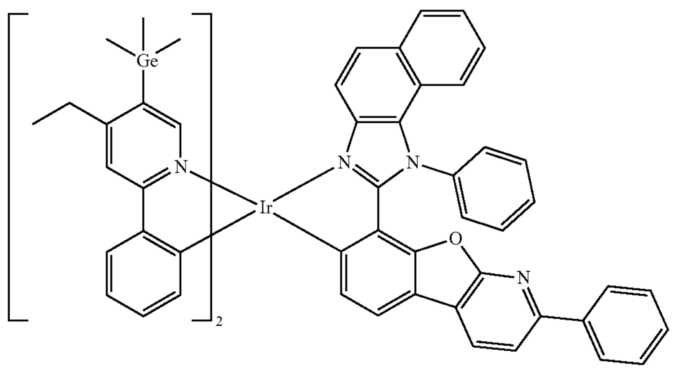
2476
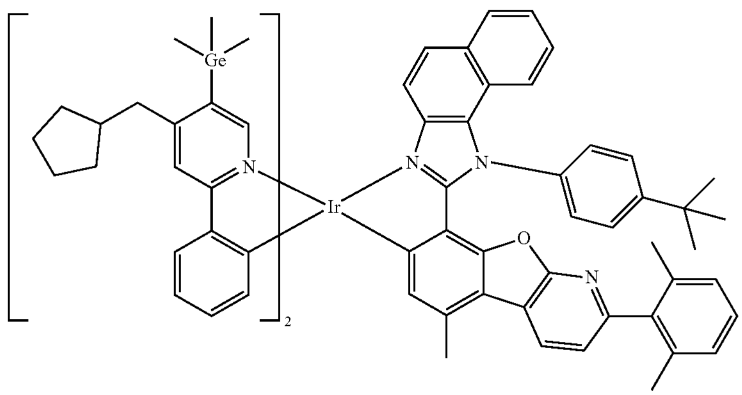

-continued
2477
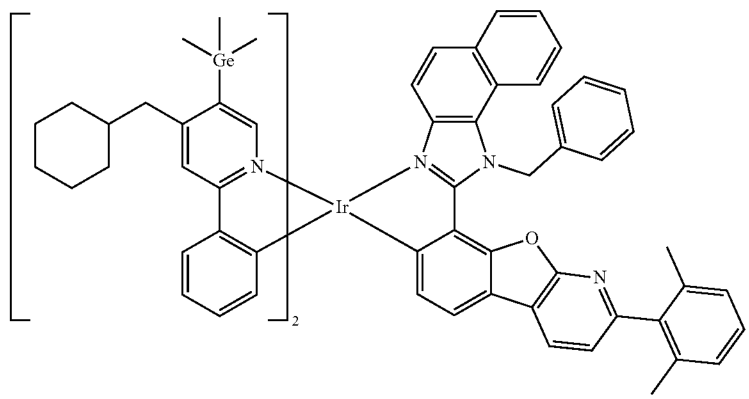
2478
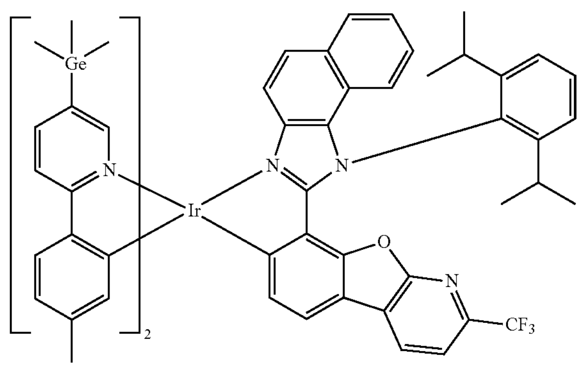
2479
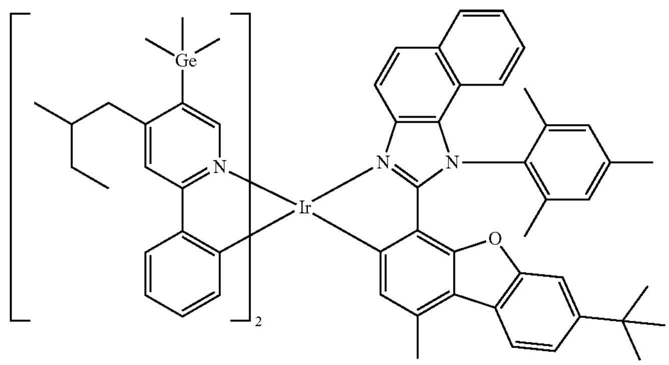
2480
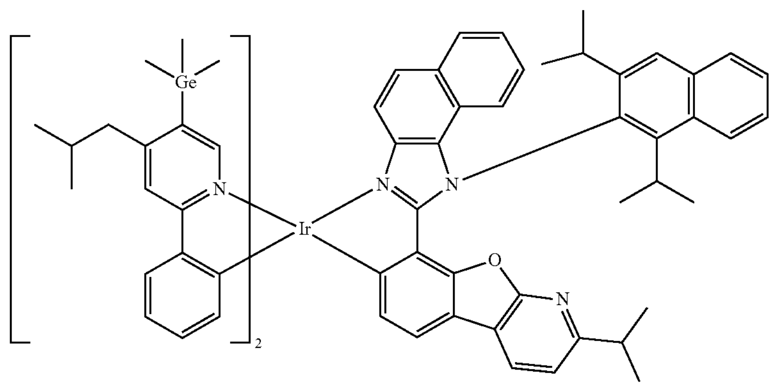

-continued
2481
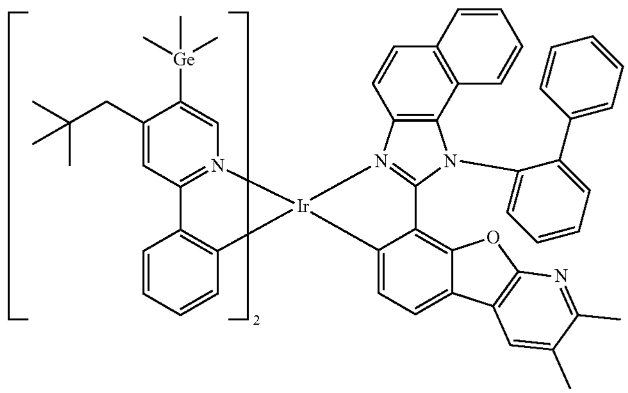
2482
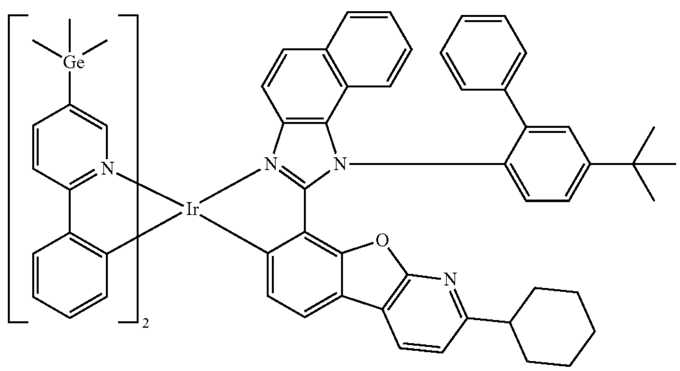
2483
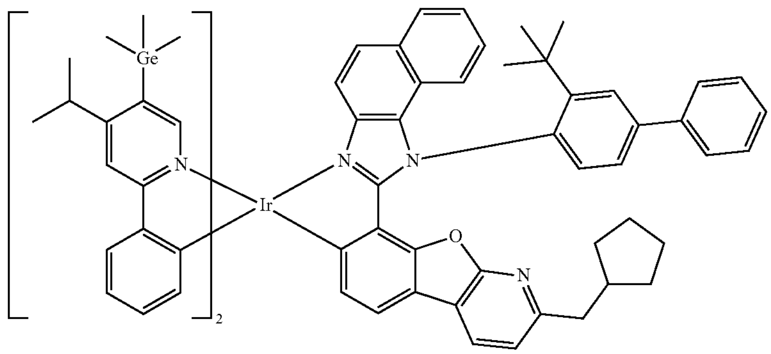
2484
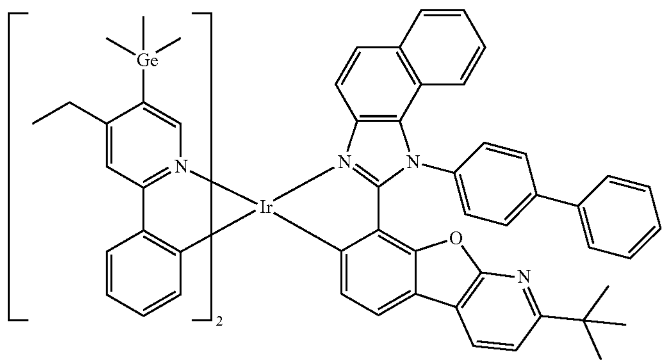

-continued
2485
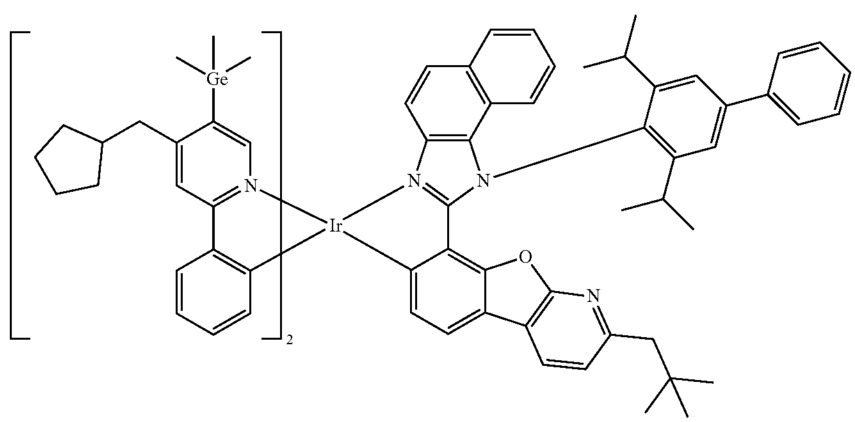
2486
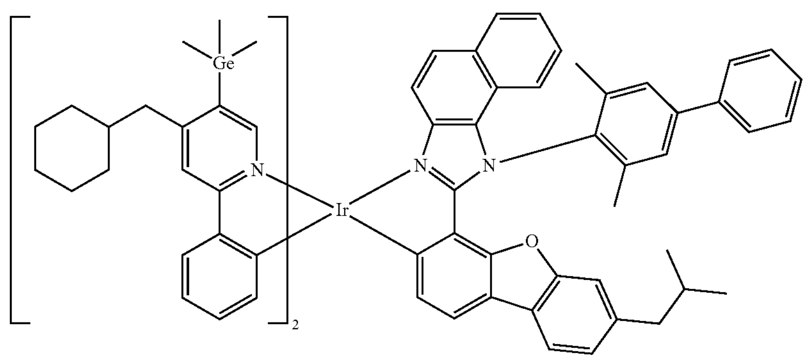
2487
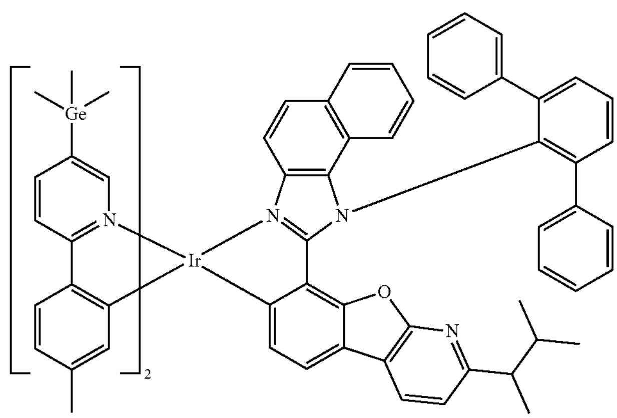
2488
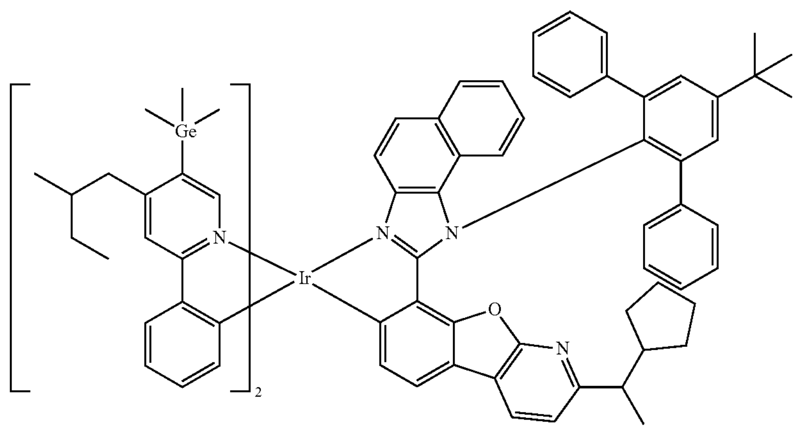

-continued
2489
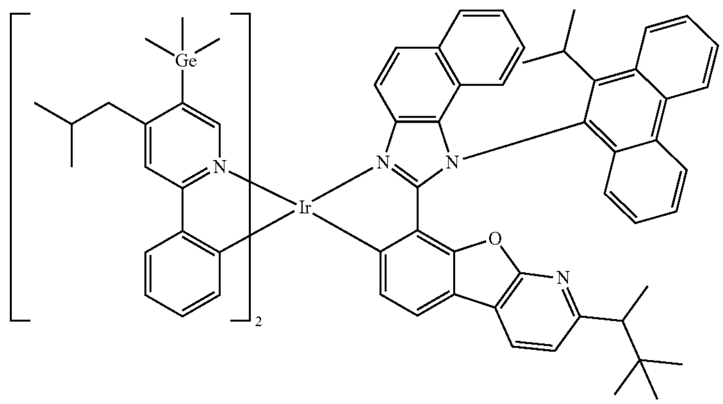
2490
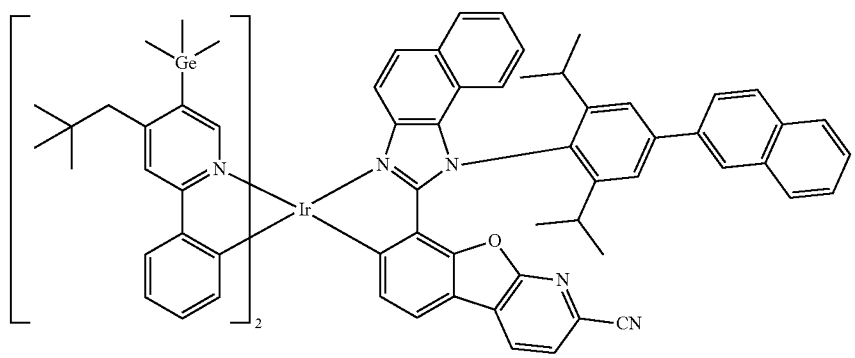
2491
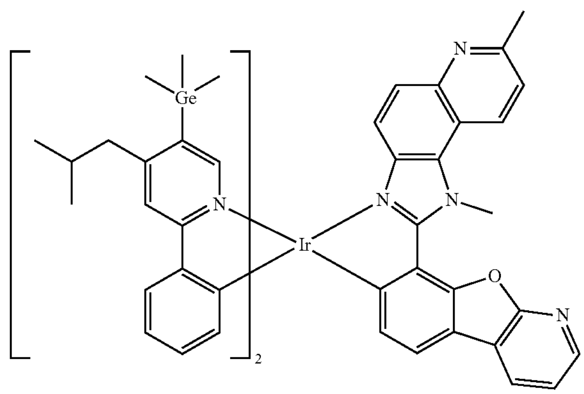
2492
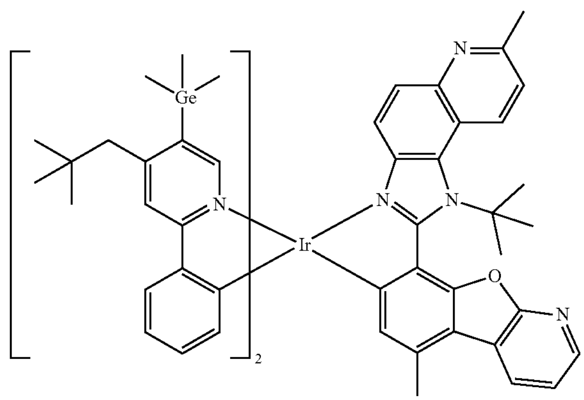

-continued
2493
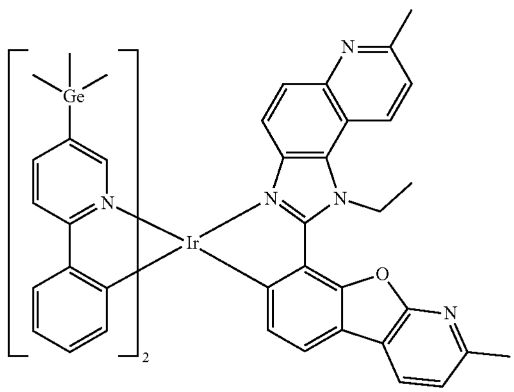
2494
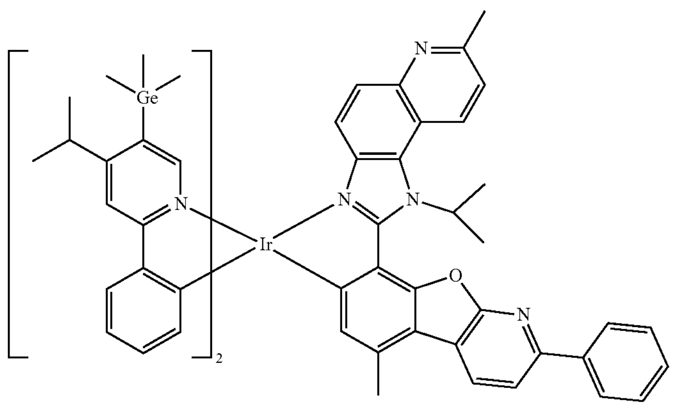
2495
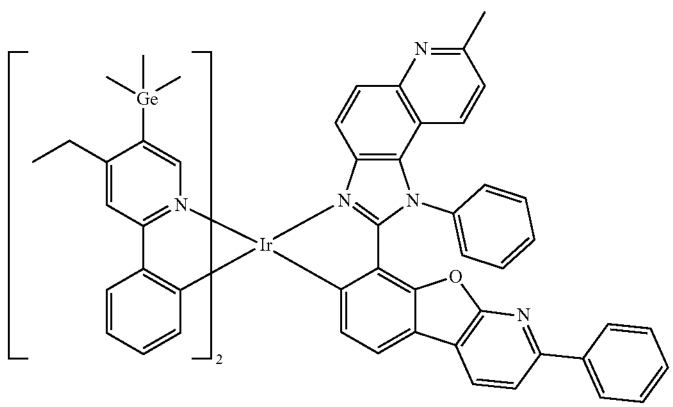
2496
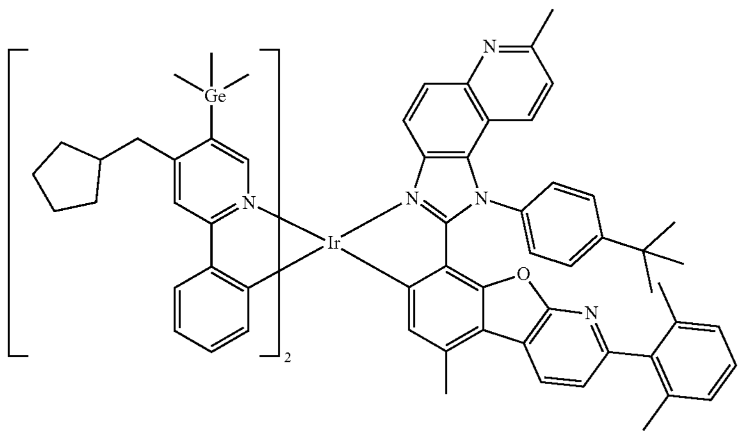

-continued
2497
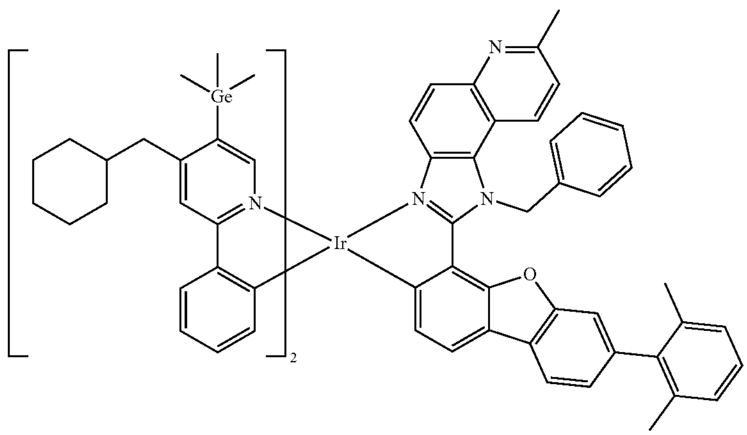
2498
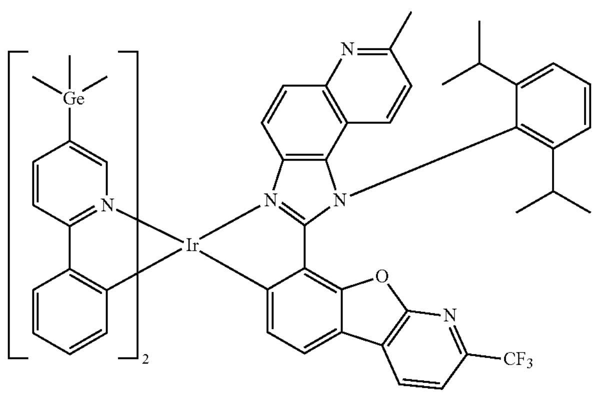
2499
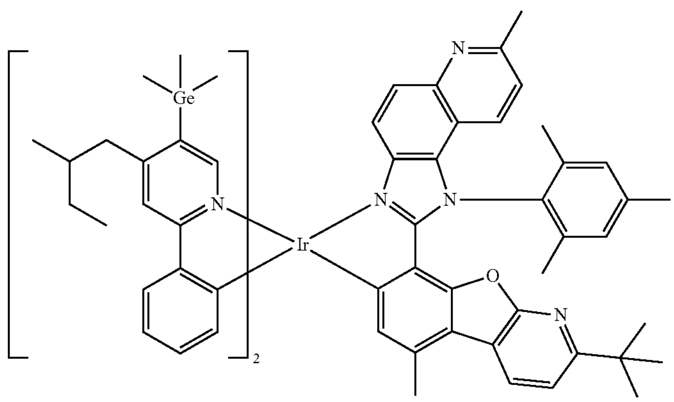
2500
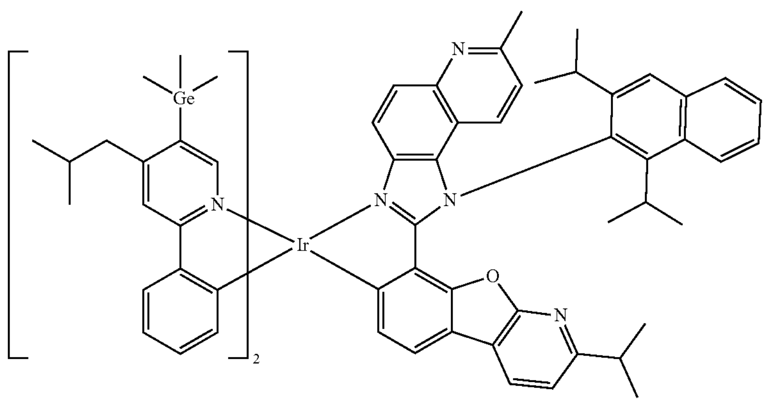

-continued
2501
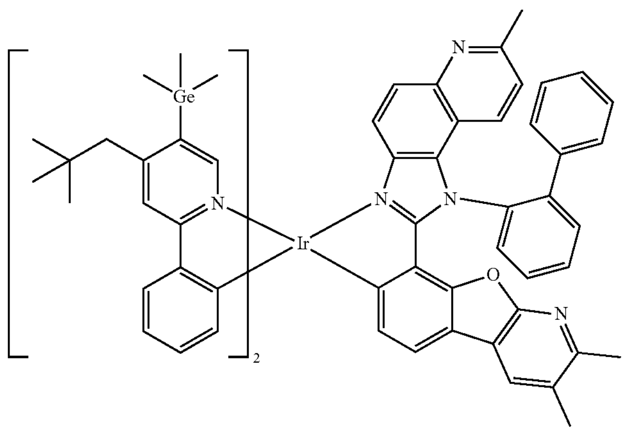
2502
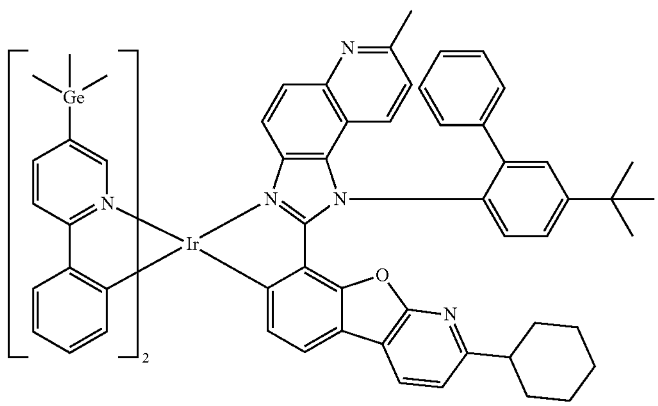
2503
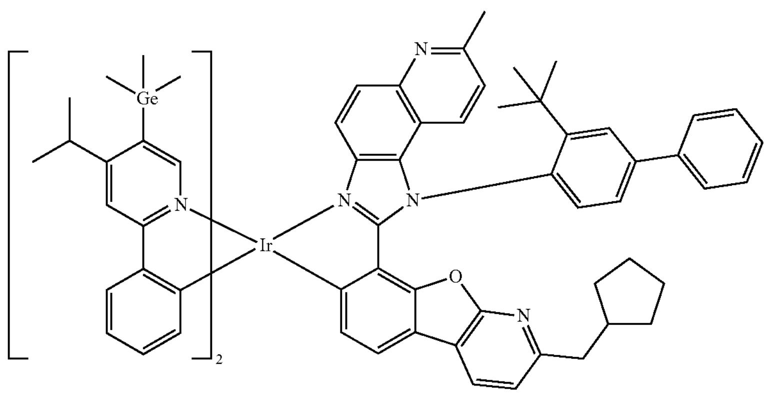
2504
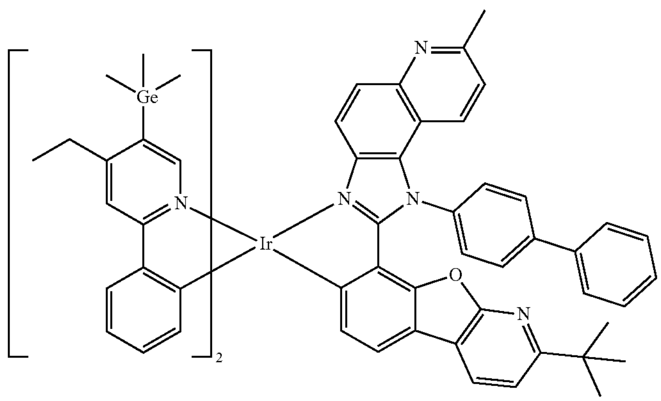

-continued
2505
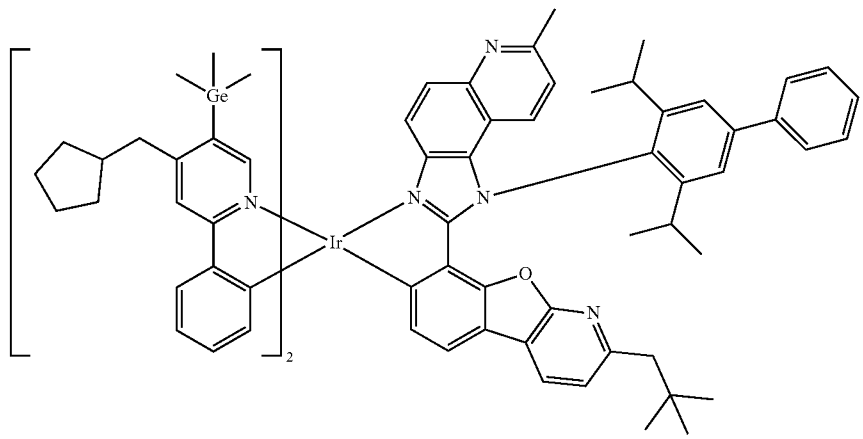
2506
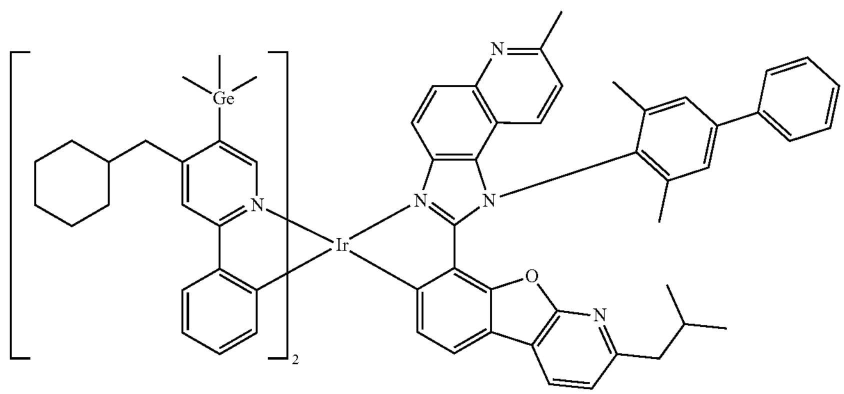
2507
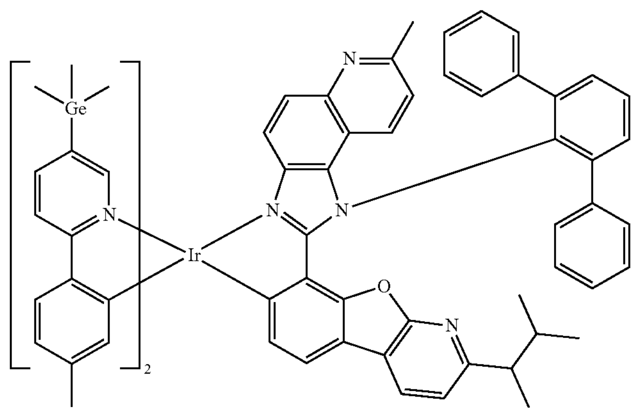

-continued
2508
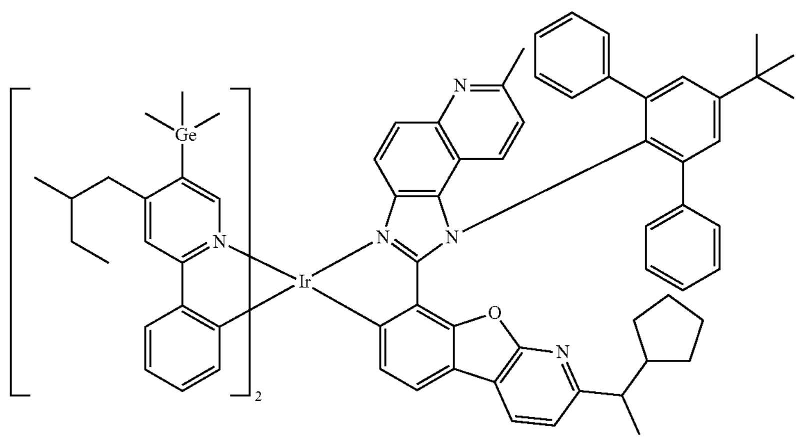
2509
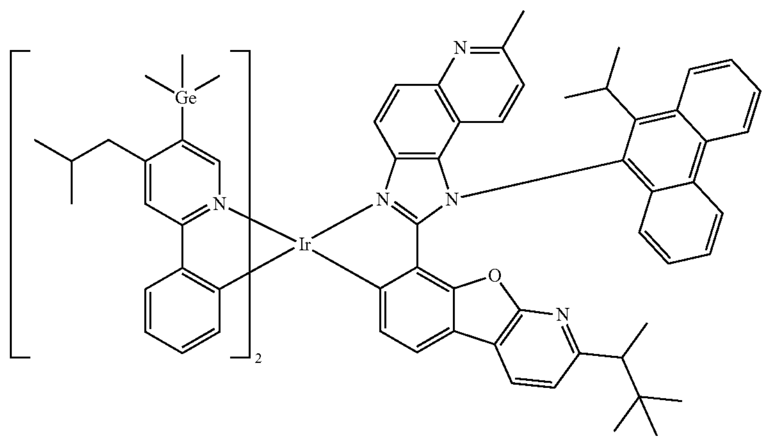
2510
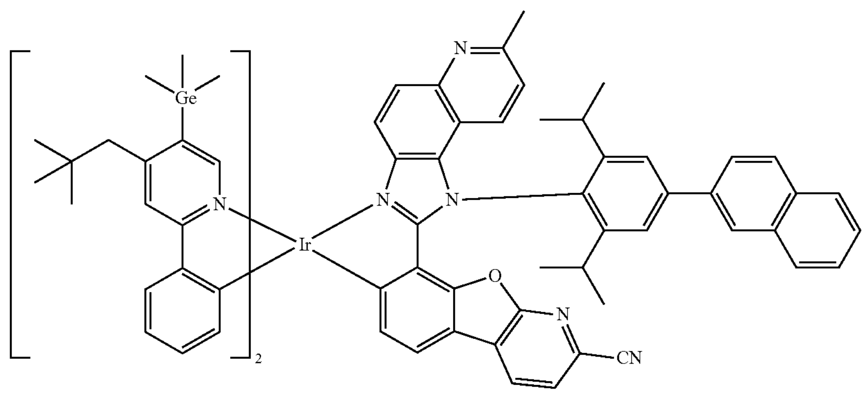
2511
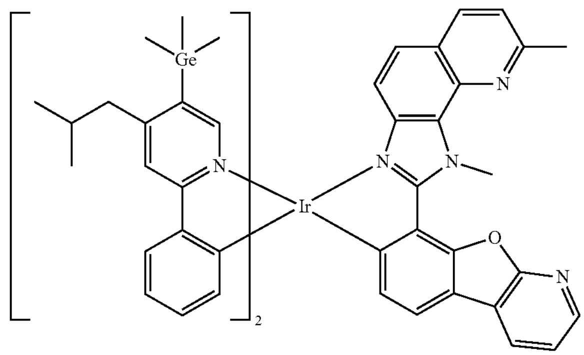

-continued
2512
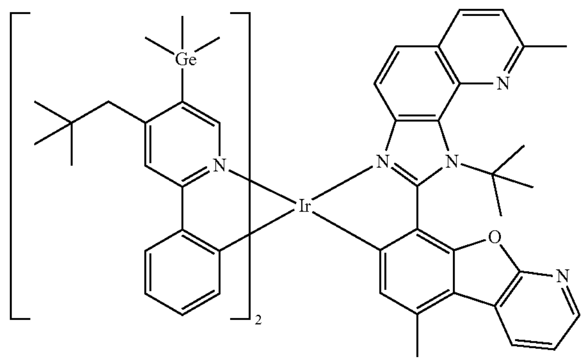
2513
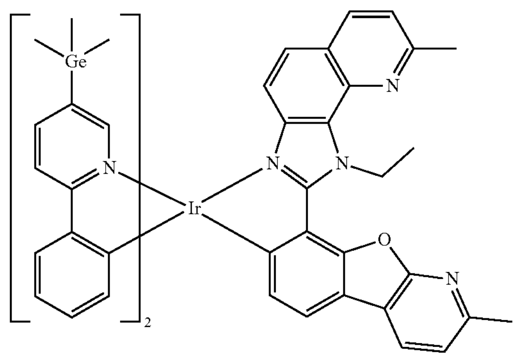
2514
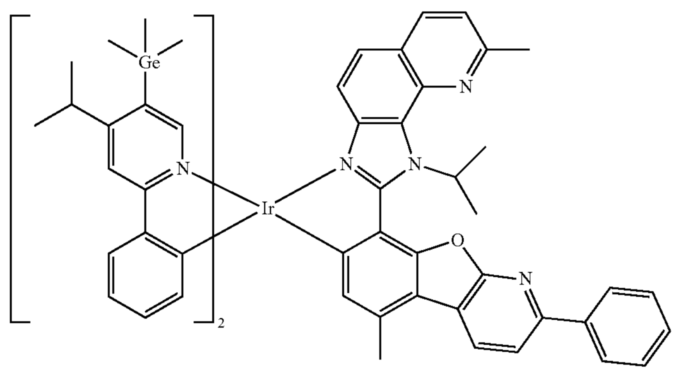
2515
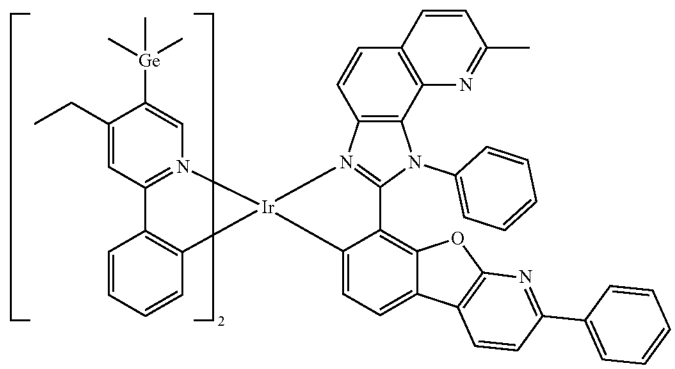

-continued
2516
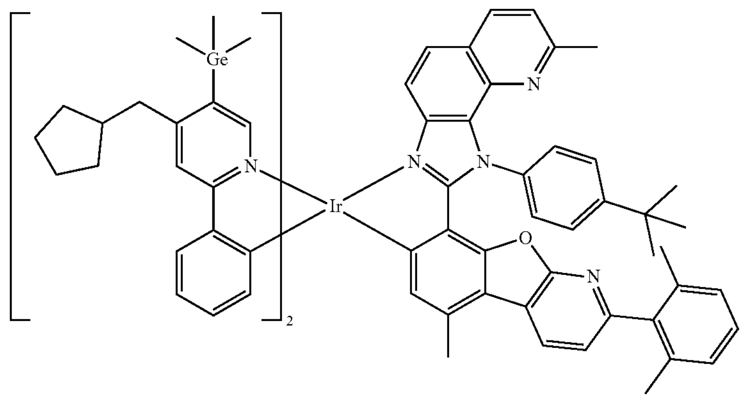
2517
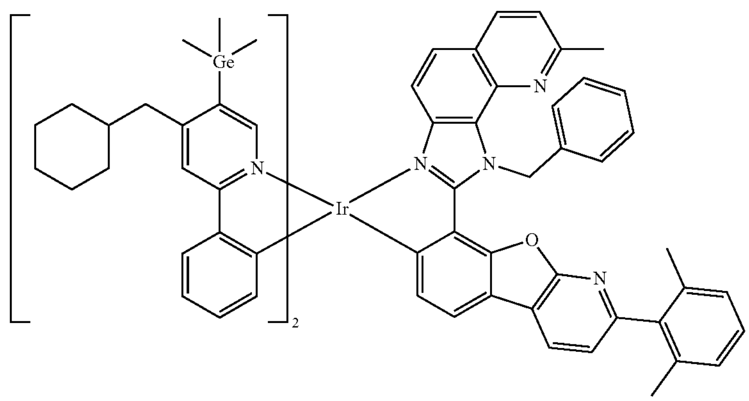
2518
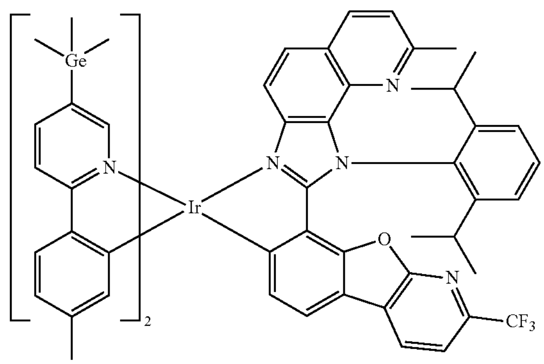
2519
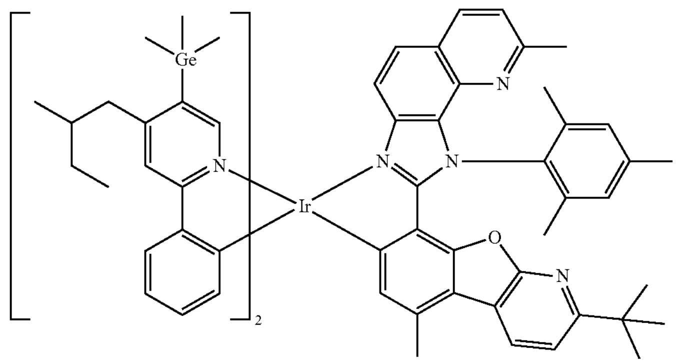

-continued
2520
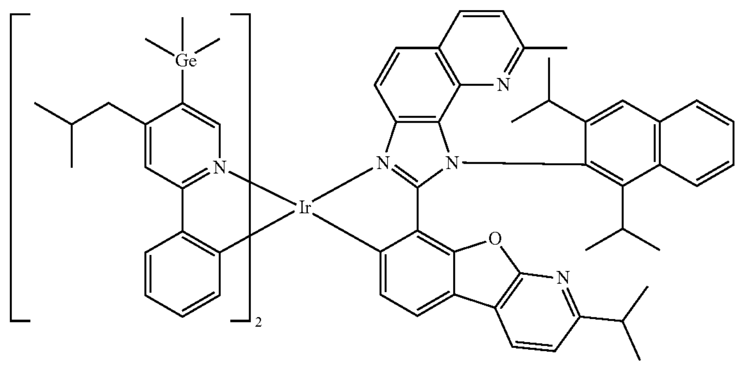
2521
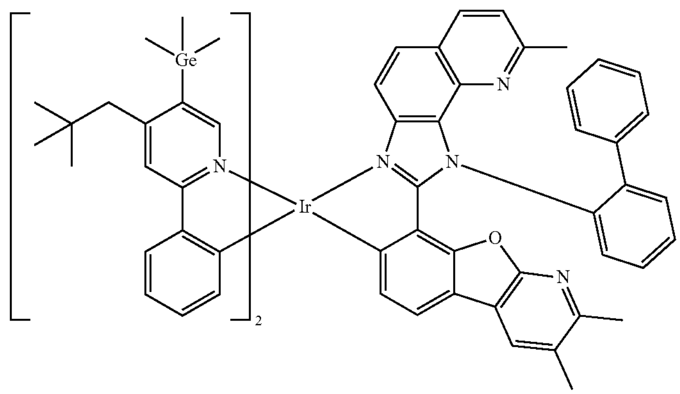
2522
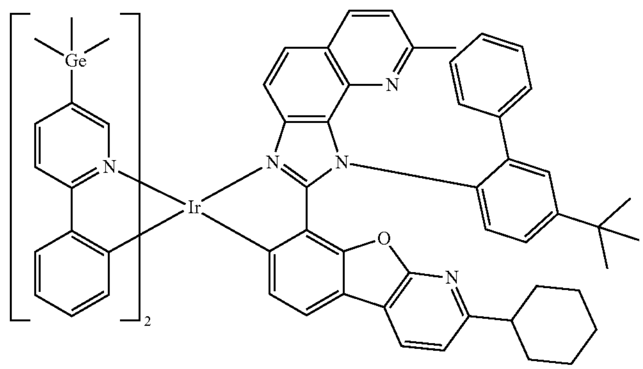
2523
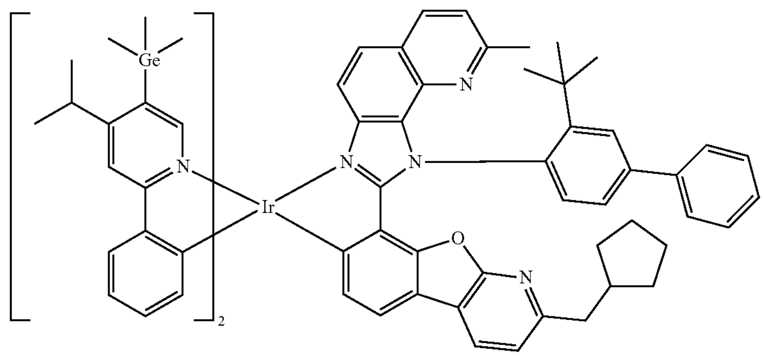

-continued
2524
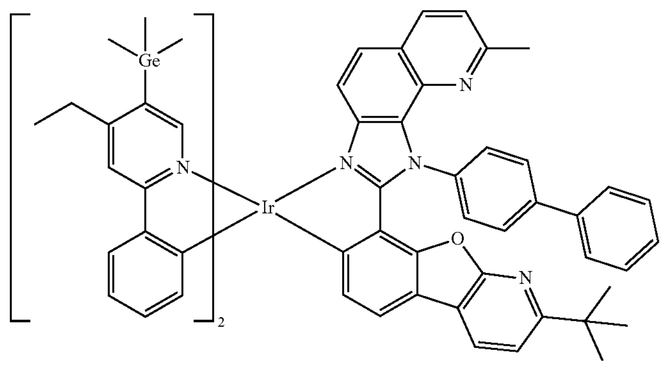
2525
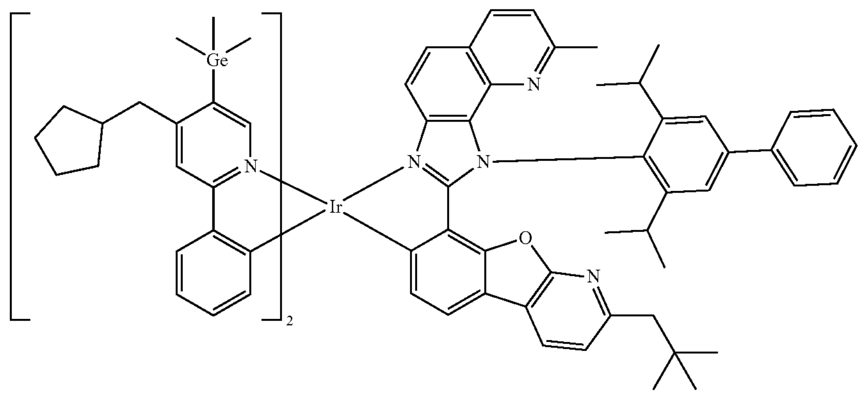
2526
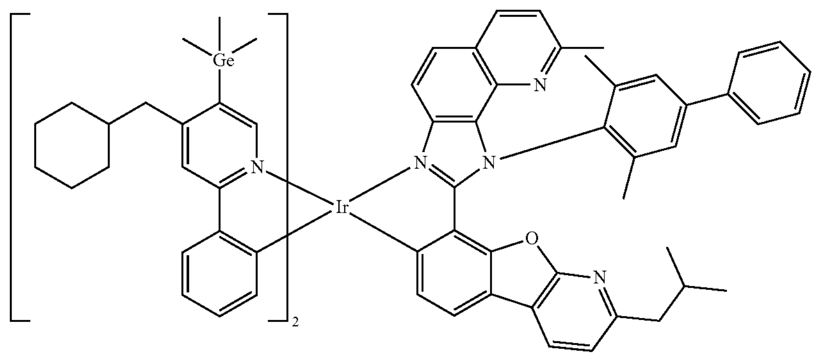
2527
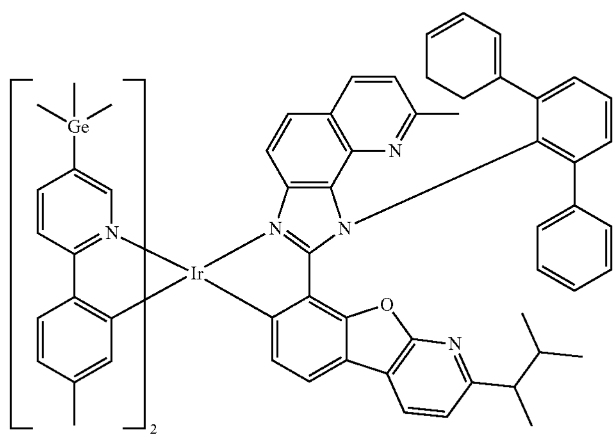

-continued
2528
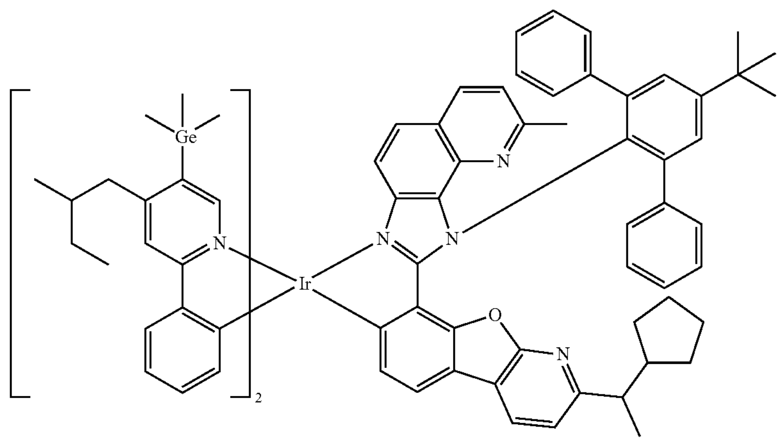
2529
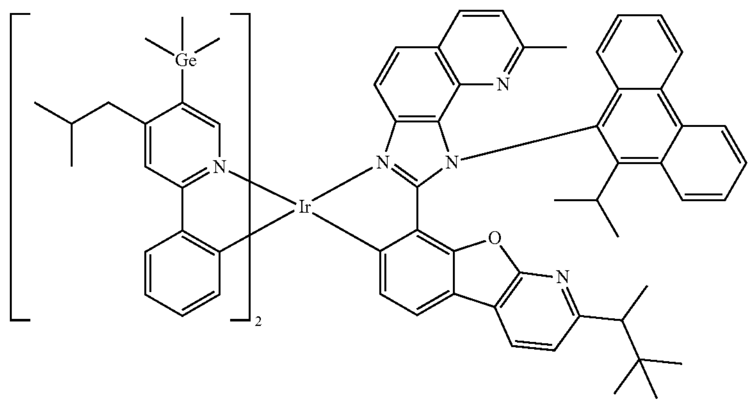
2530
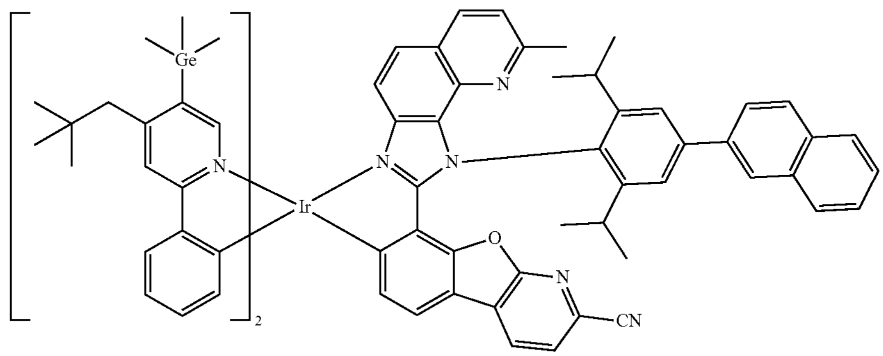
2531
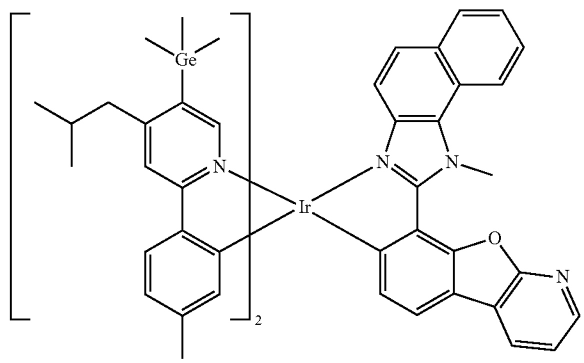

-continued
2532
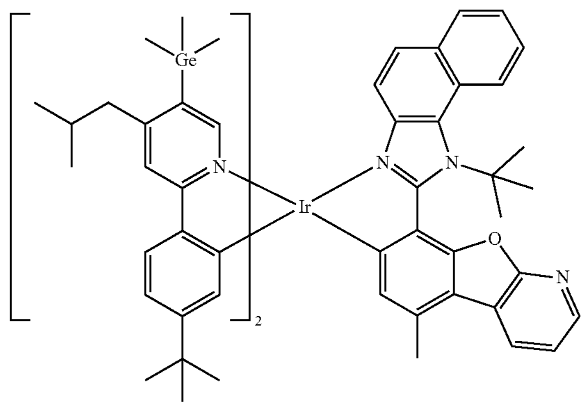
2533
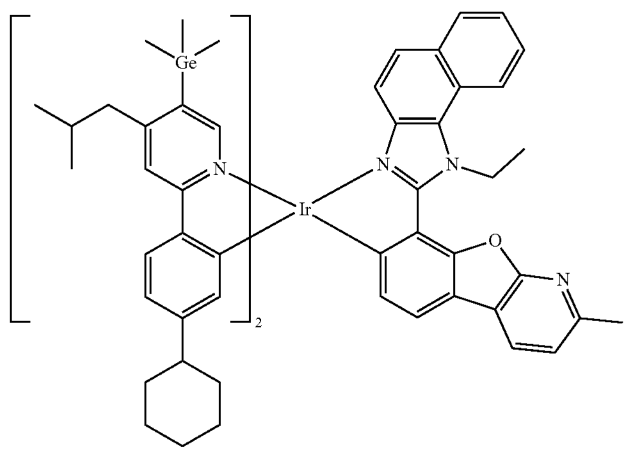
2534
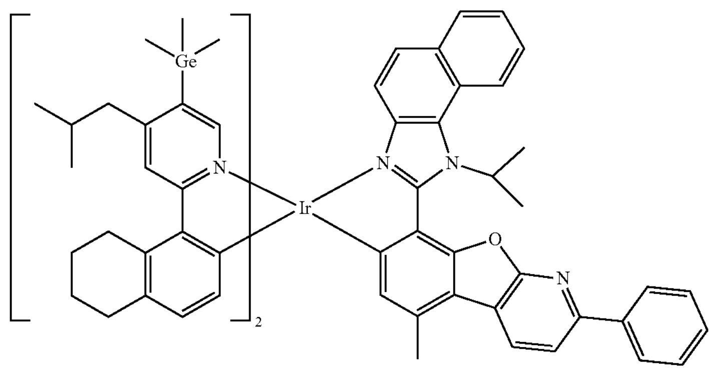
2535
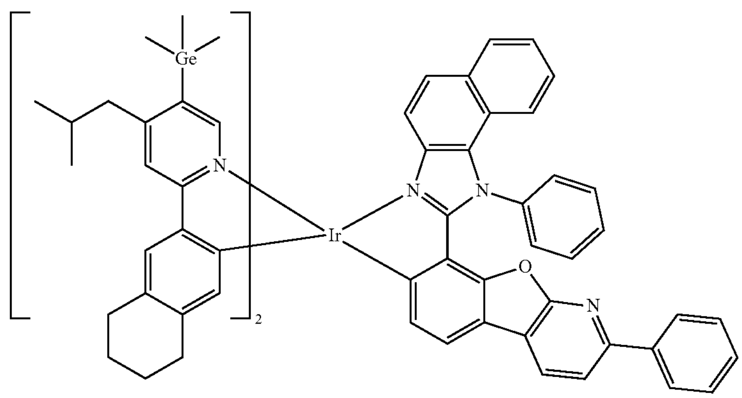

-continued
2536
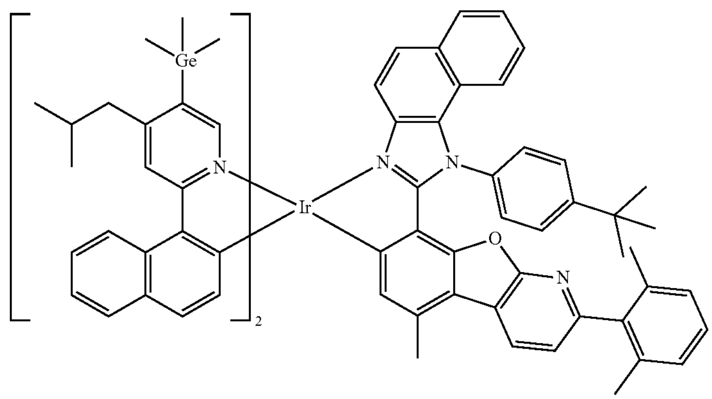
2537
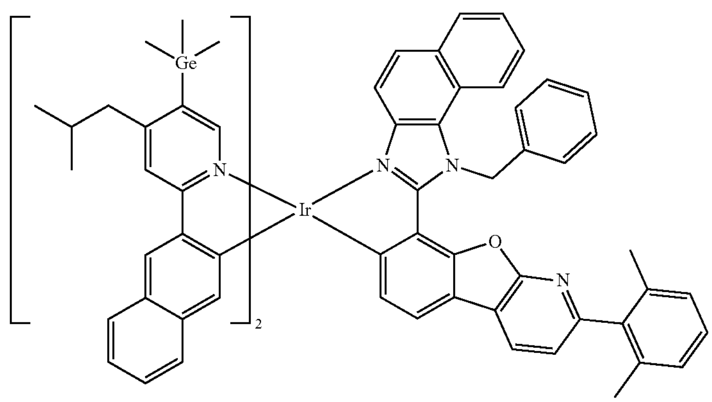
2538
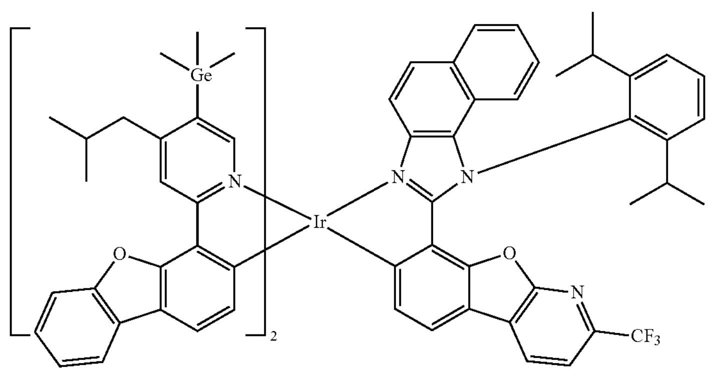
2539
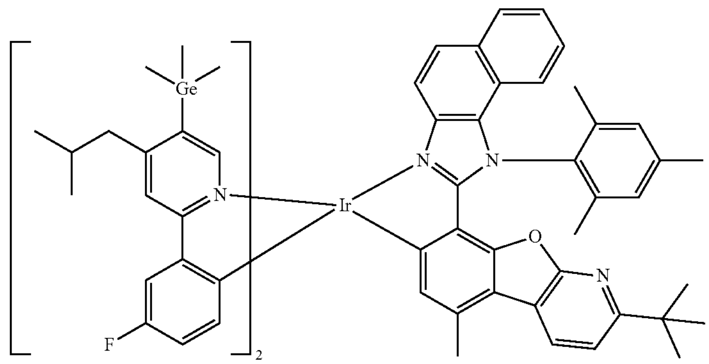

-continued
2540
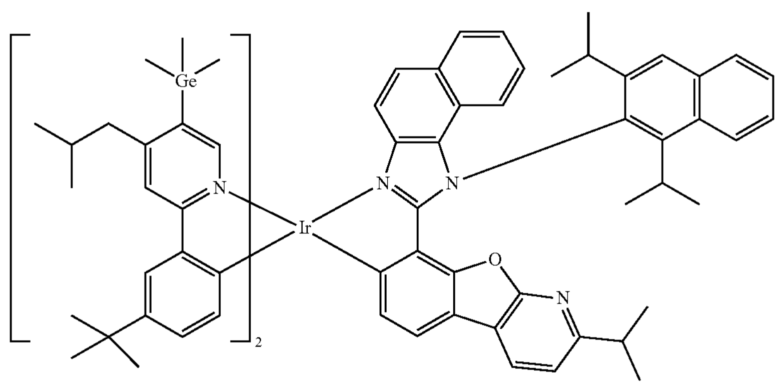
2541
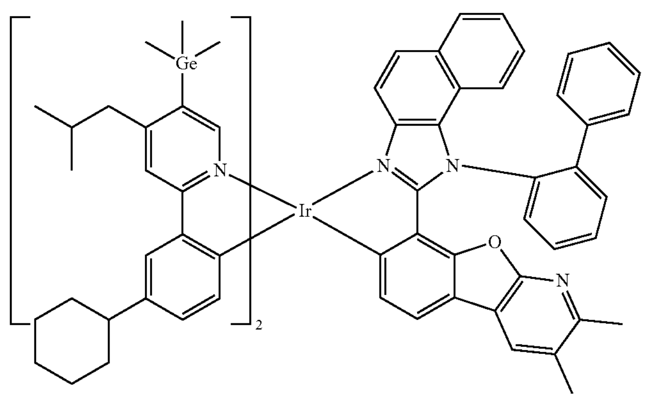
2542
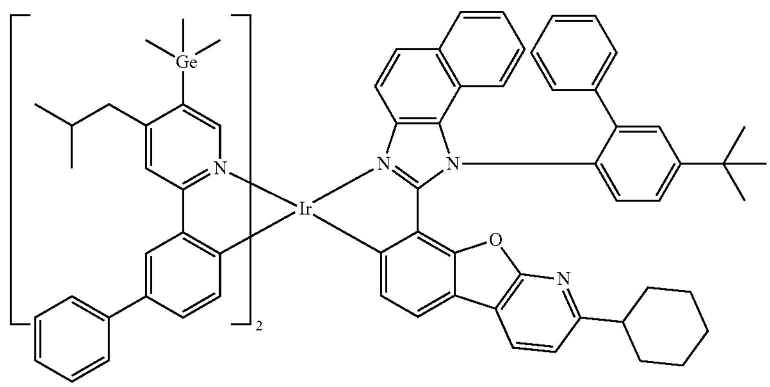
2543
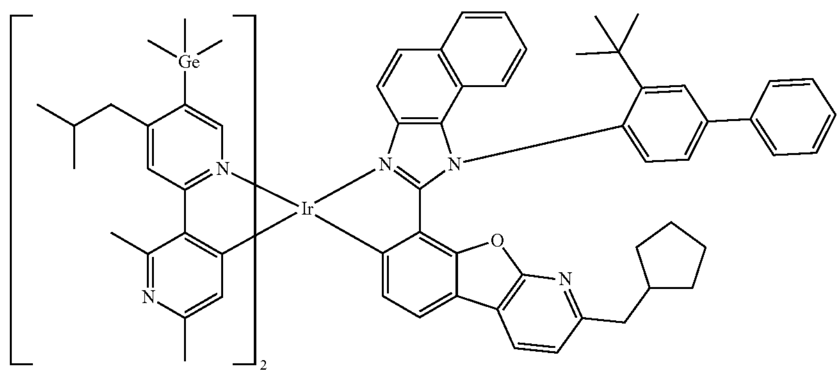

-continued
2544
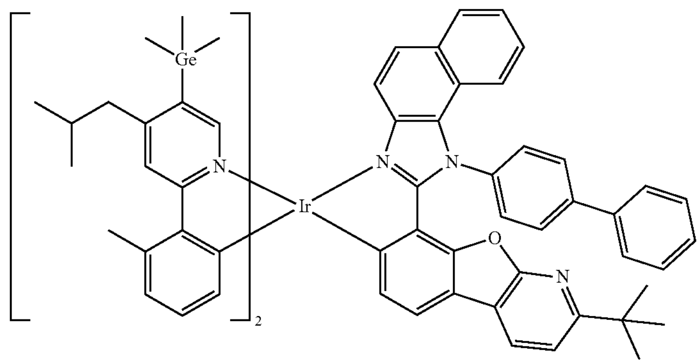
2545
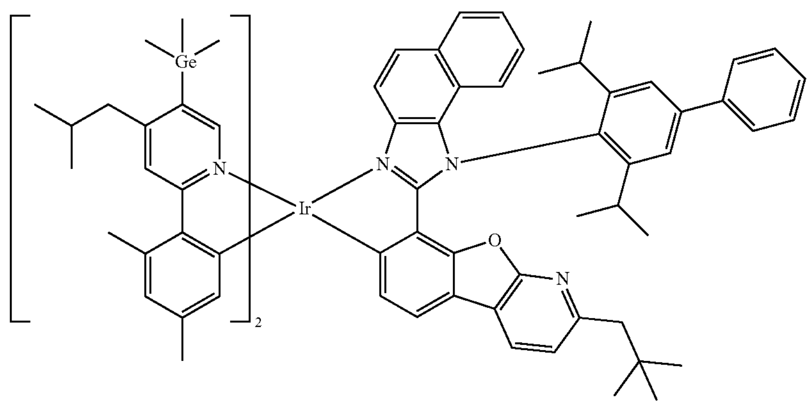
2546
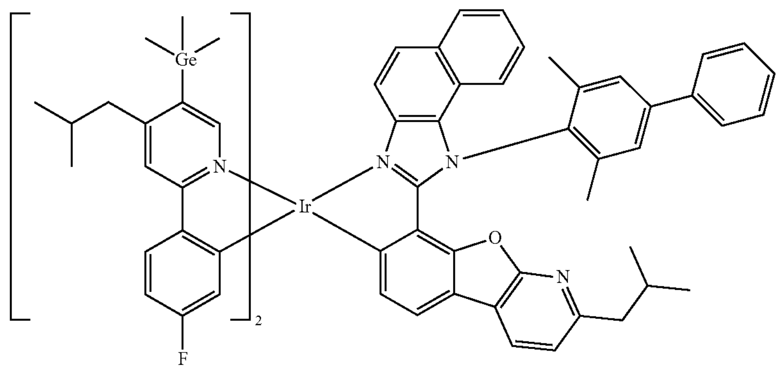
2547
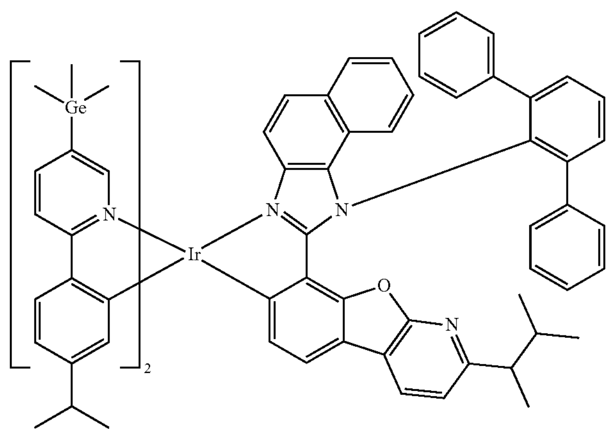

-continued
2548
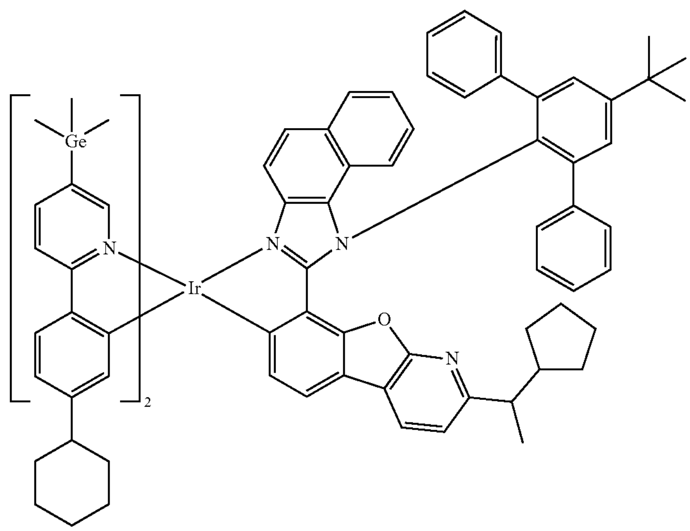
2549
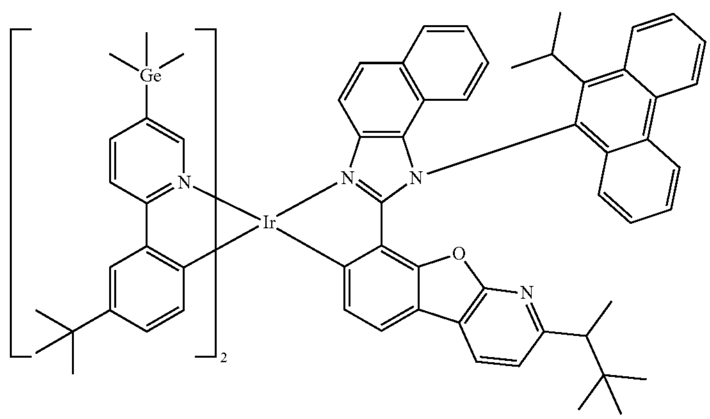
2550
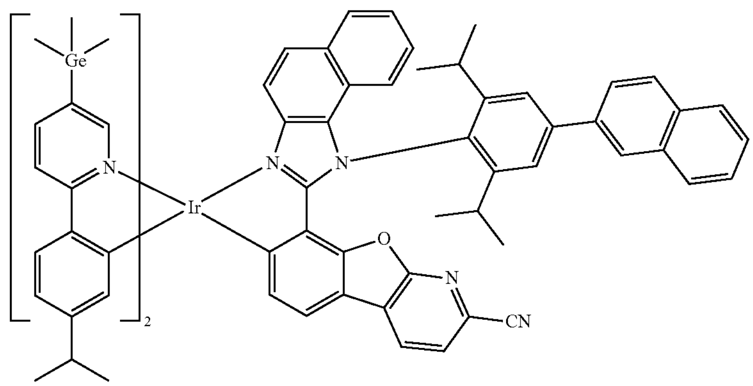

2551
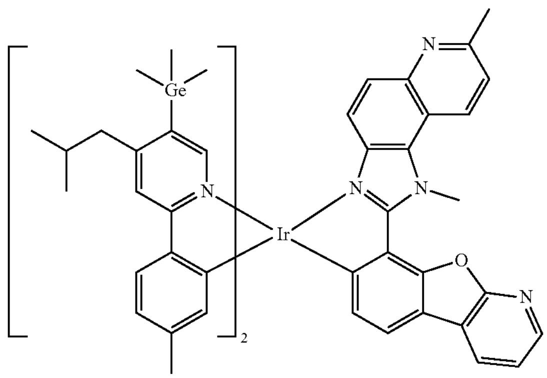
2552
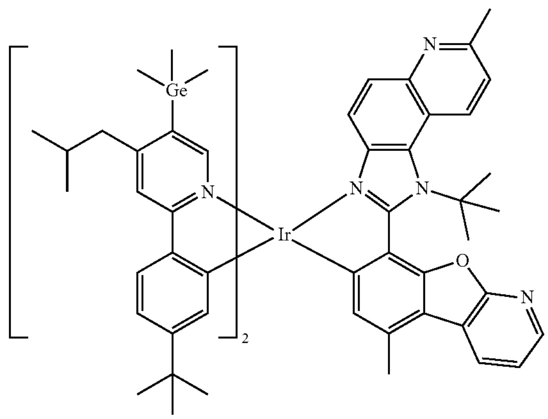
2553
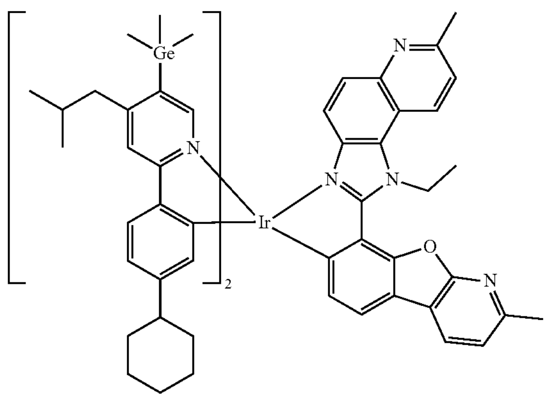
2554
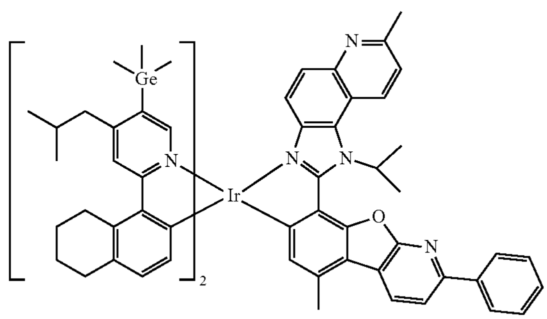
2555
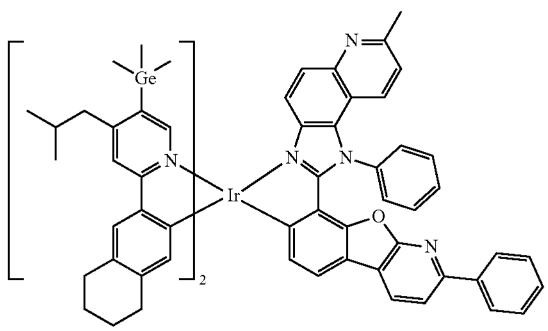
2556
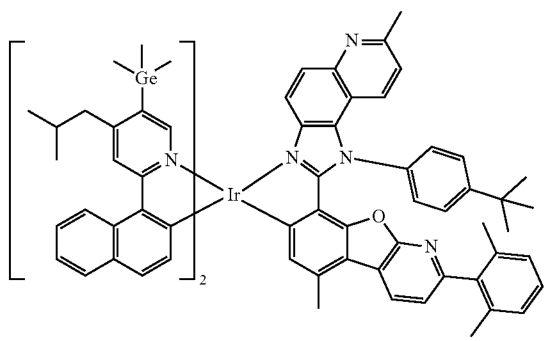
2557
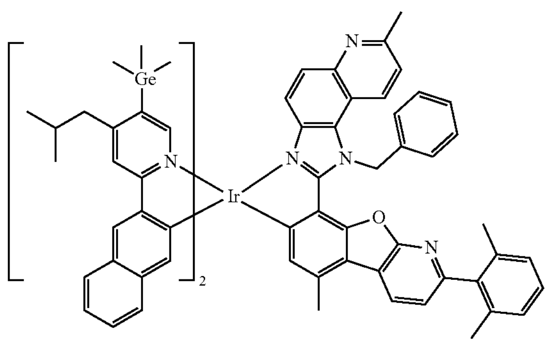
2558
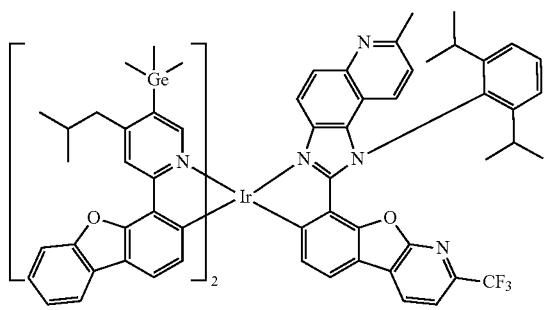

-continued
2559
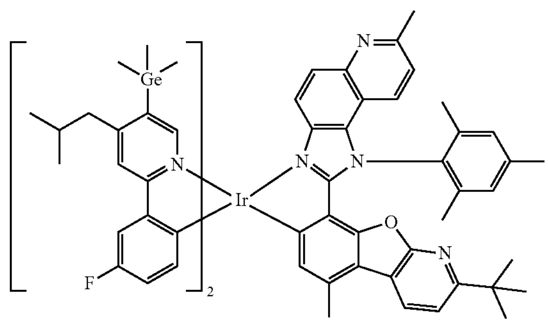
2560
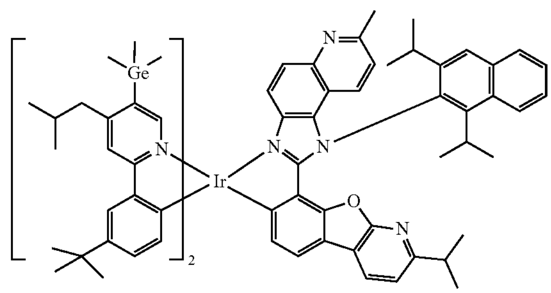
2561
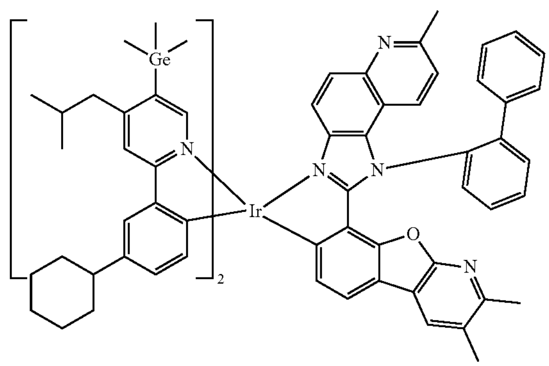
2562
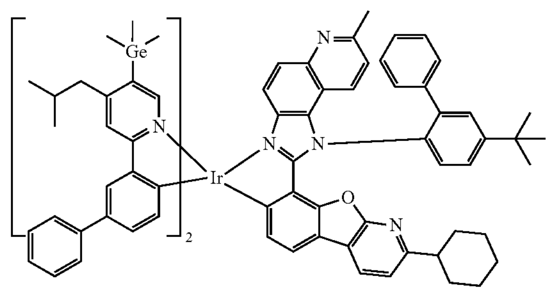
2563
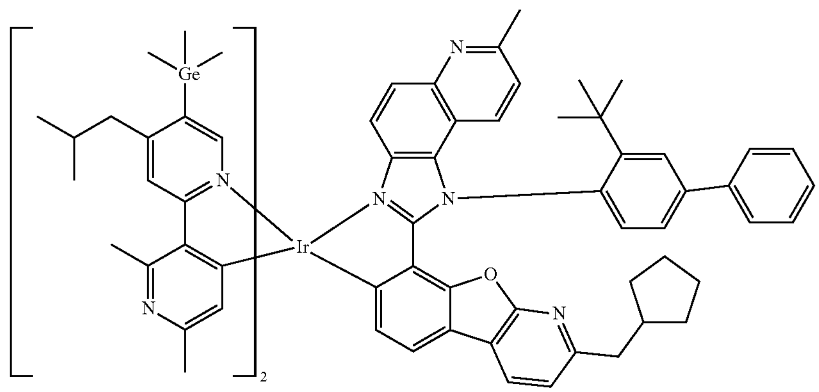
2564
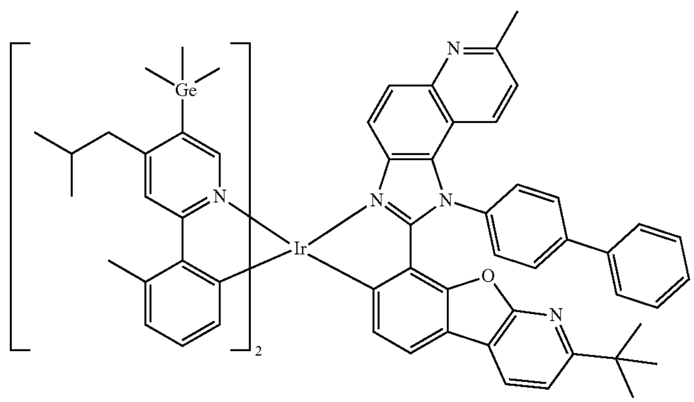

-continued
2565
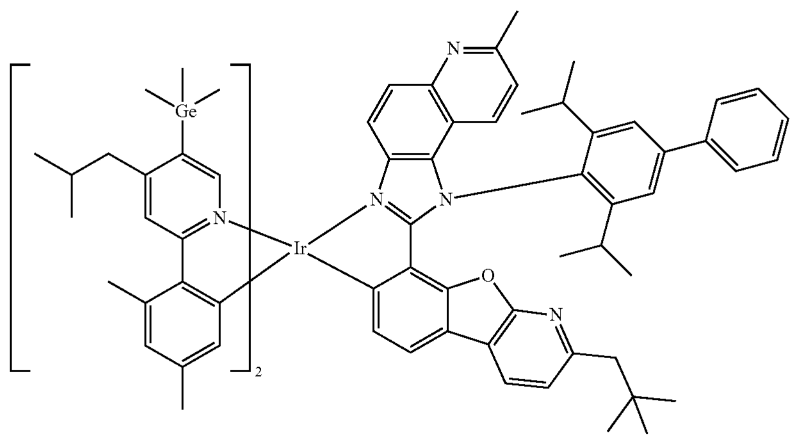
2566
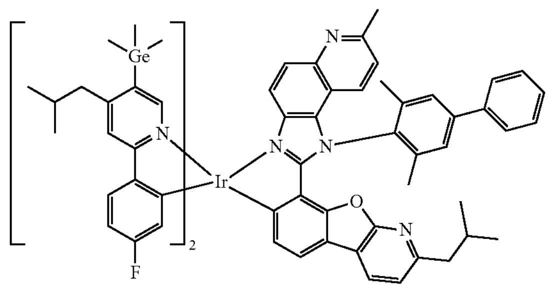
2567
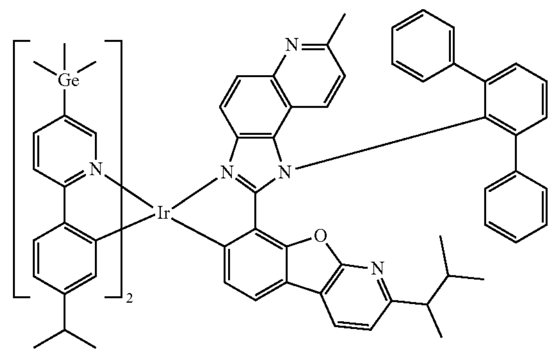
2568
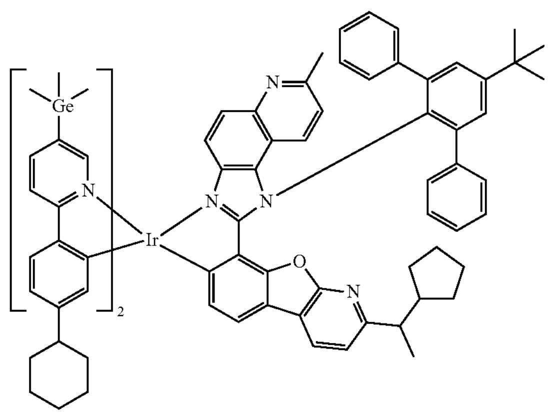
2569
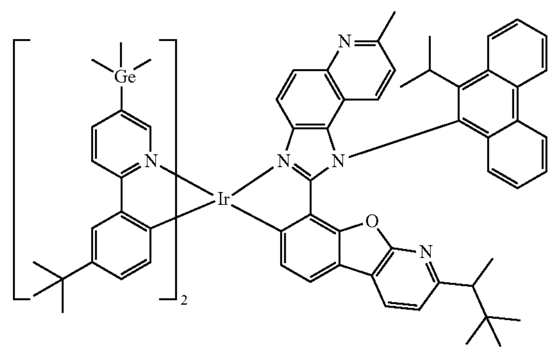
2570
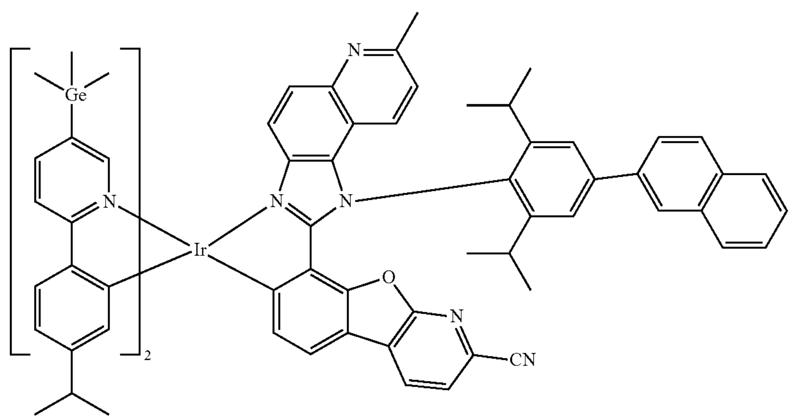

-continued
2571
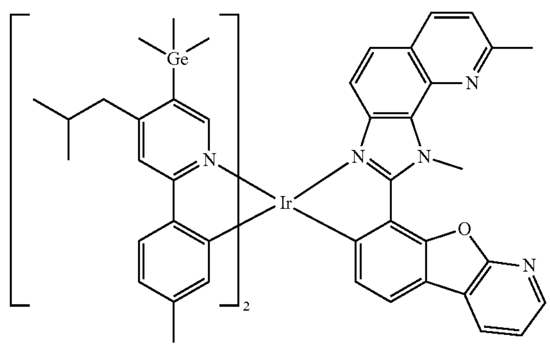
2572
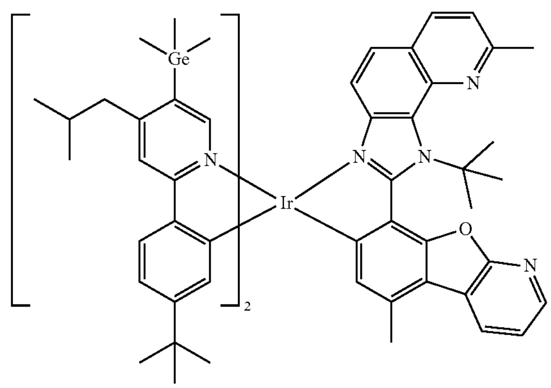
2573
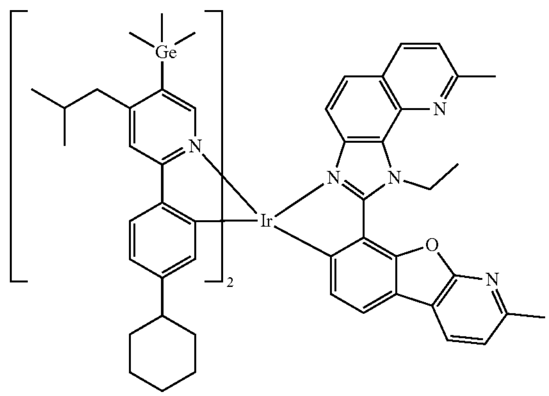
2574
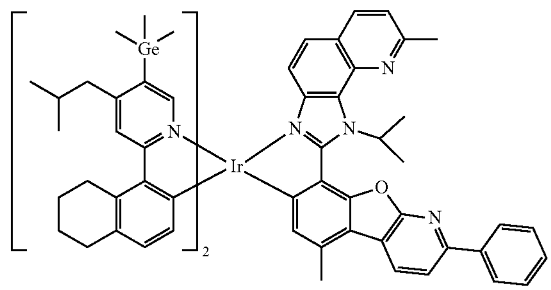
2575
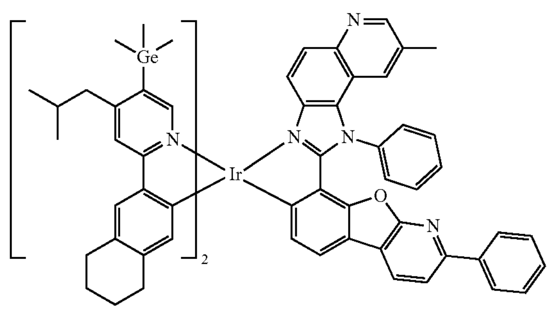
2576
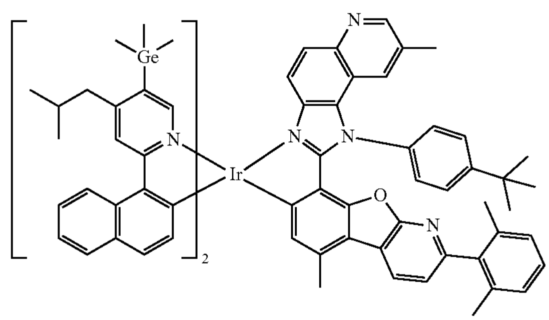
2577
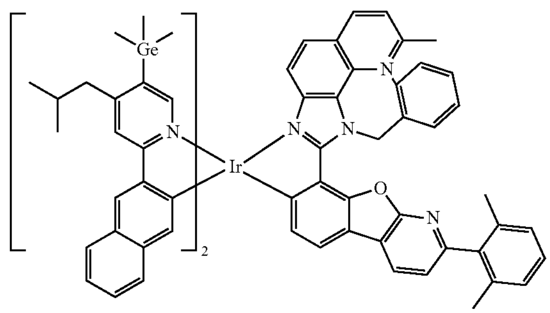
2578
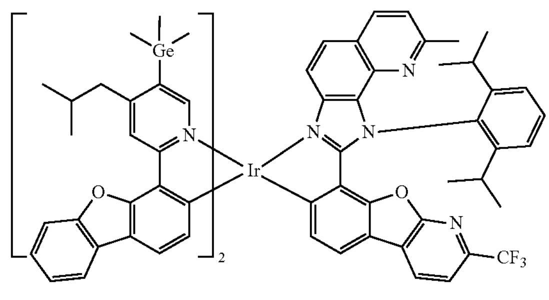

-continued
2579
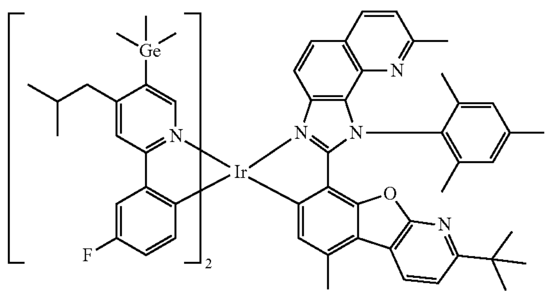
2580
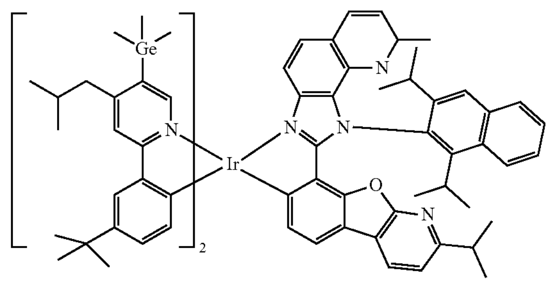
2581
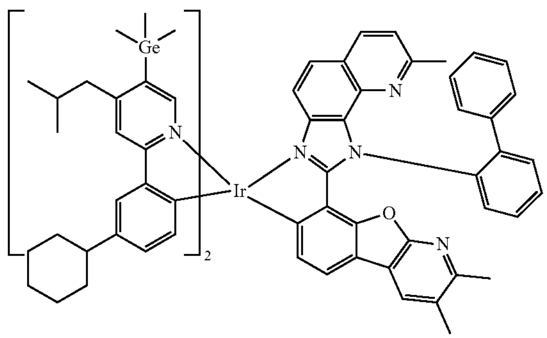
2582
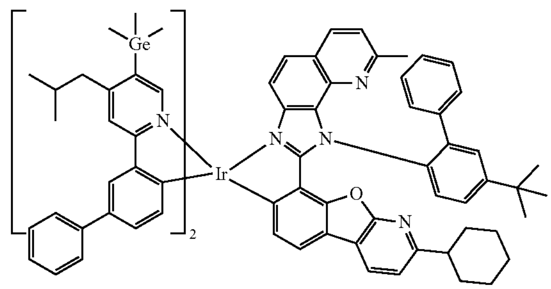
2583
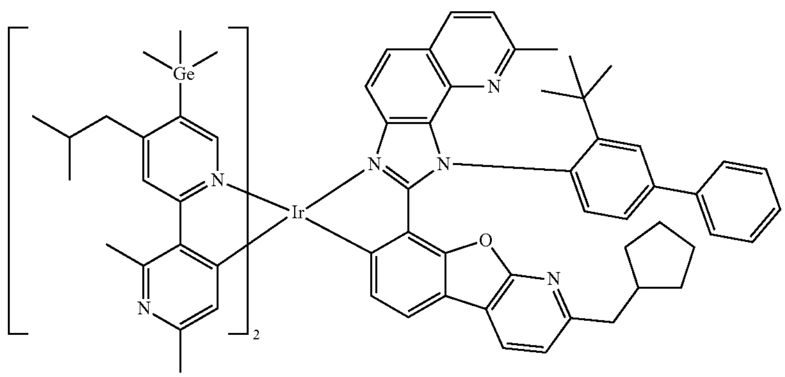
2584
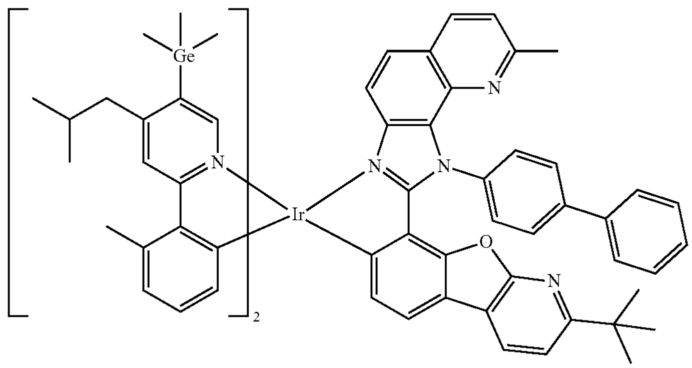

-continued
2585
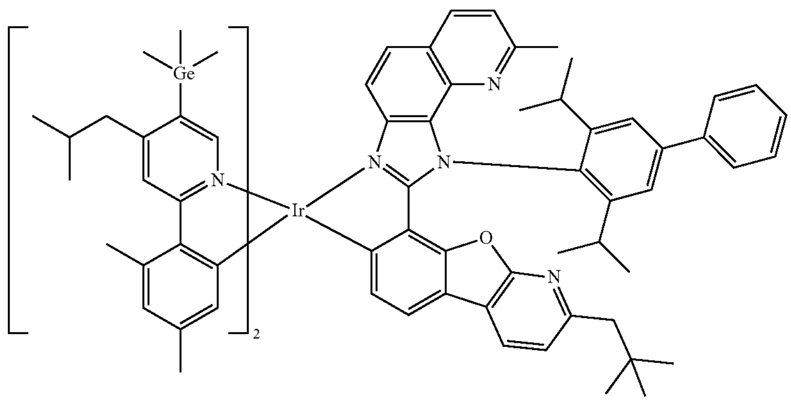
2586
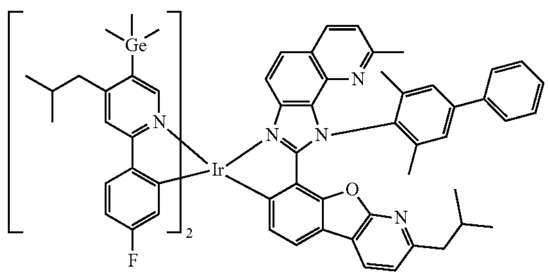
2587
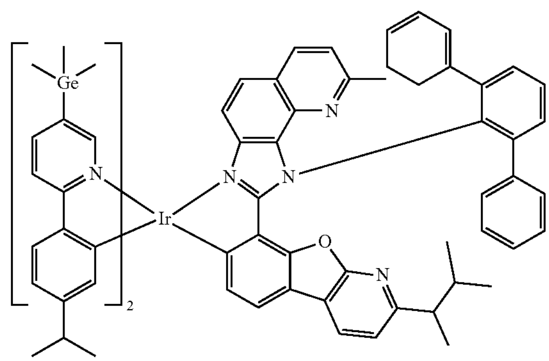
2588
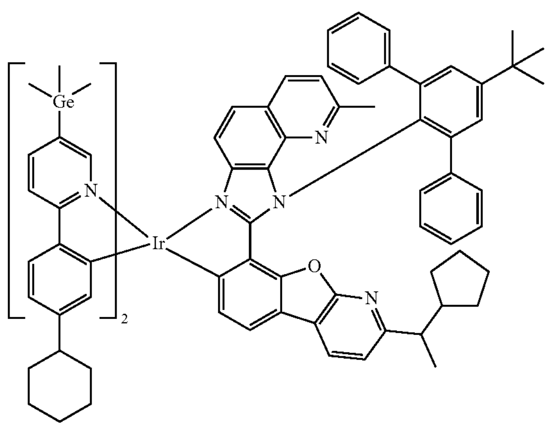
2589
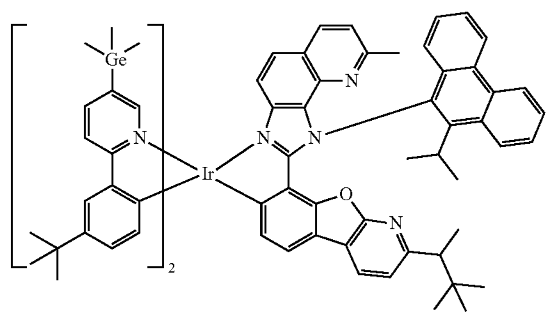
2590
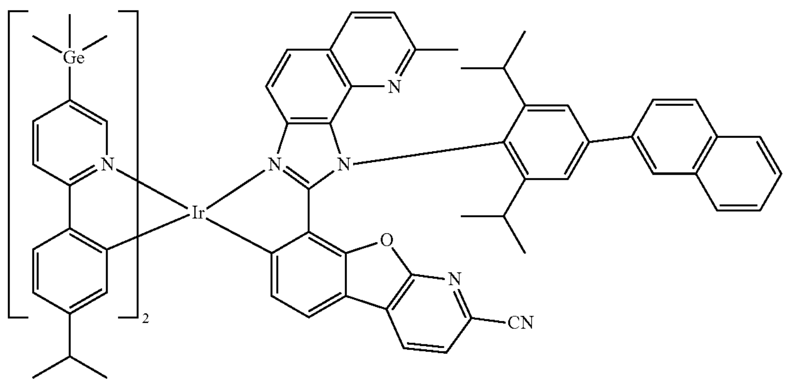

-continued
2591
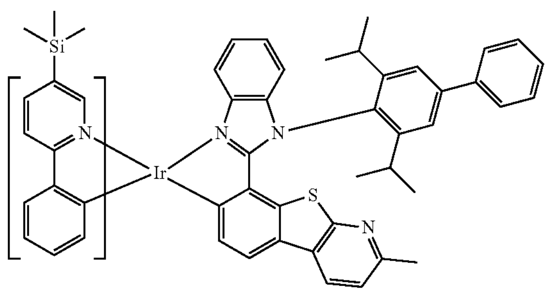
2592
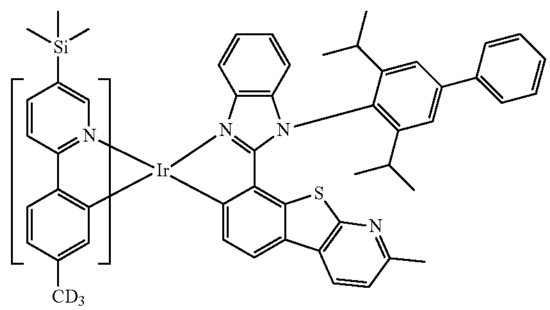
2593
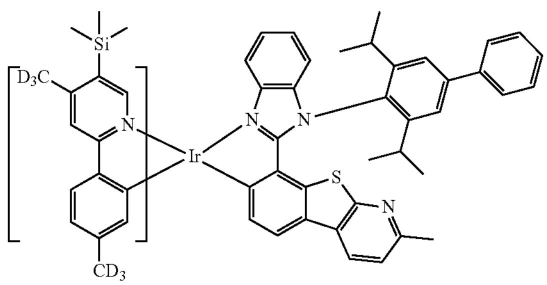
2594
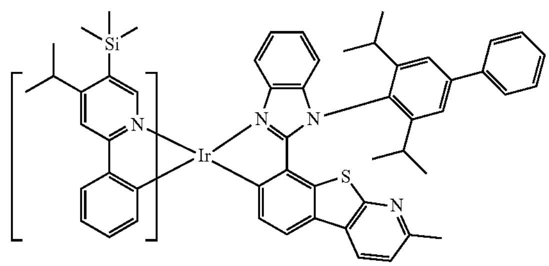
2595
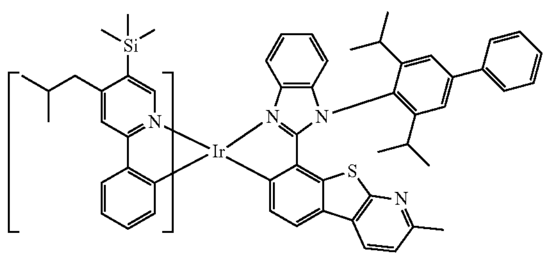
2596
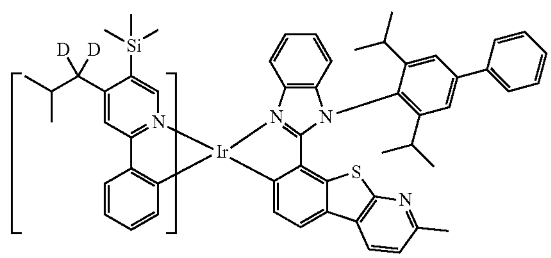
2597
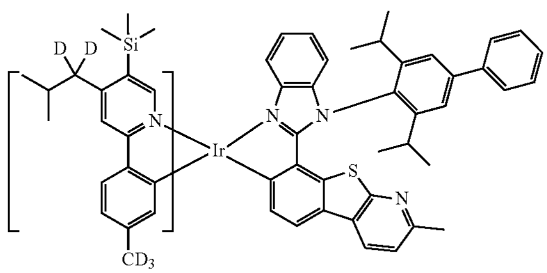
2598
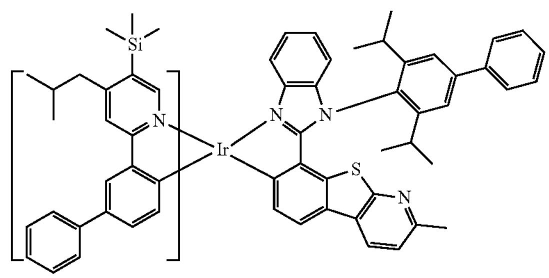
2599
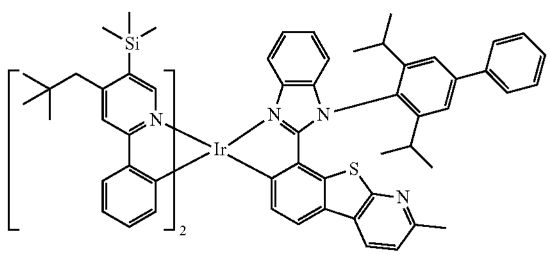
2600
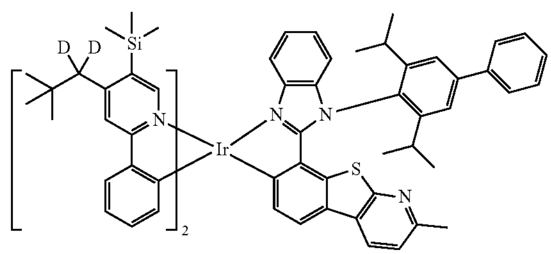

-continued
2601
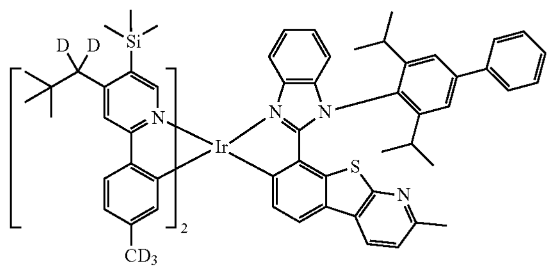
2602
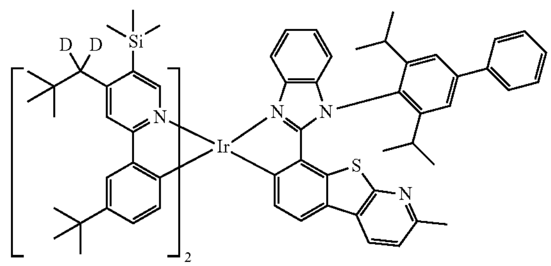
2603
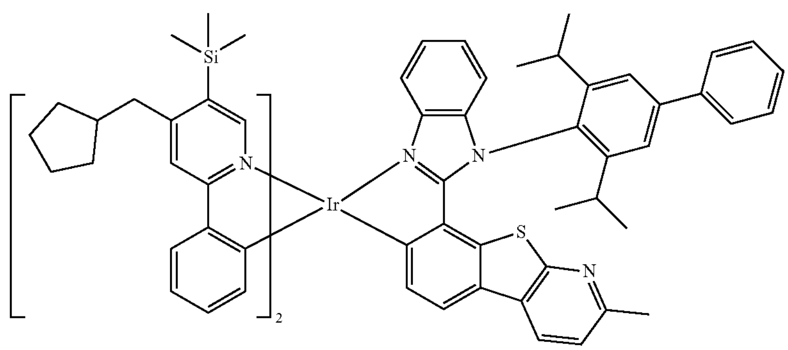
2604
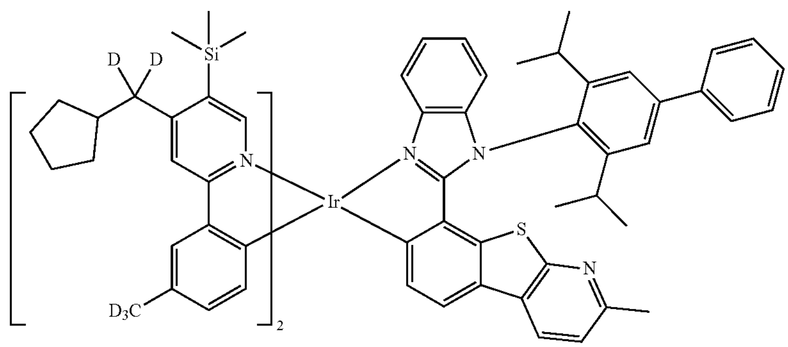
2605
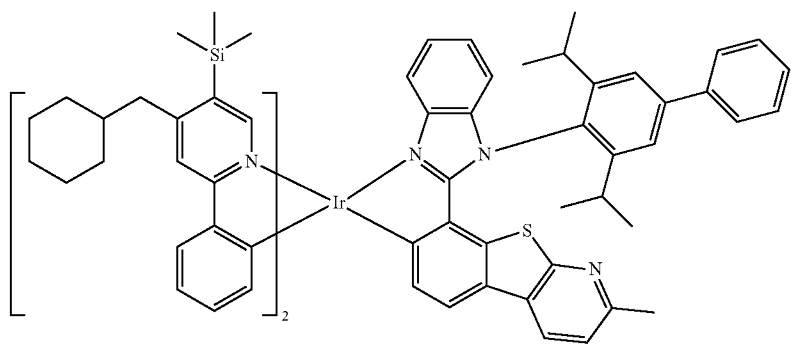

-continued
2606
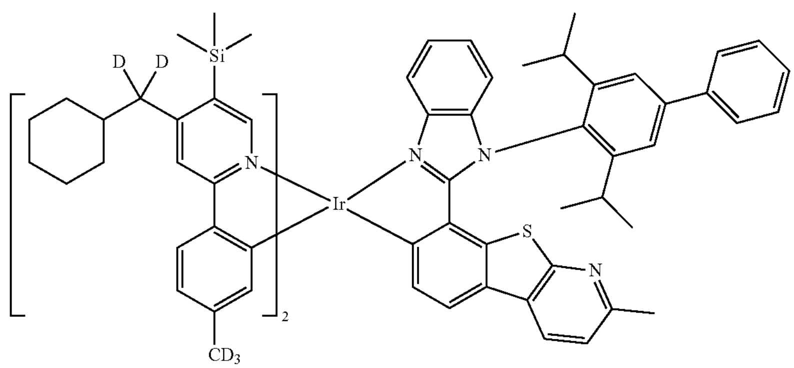
2607
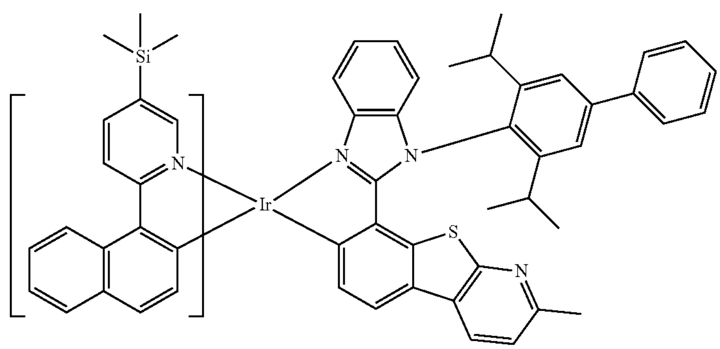
2608
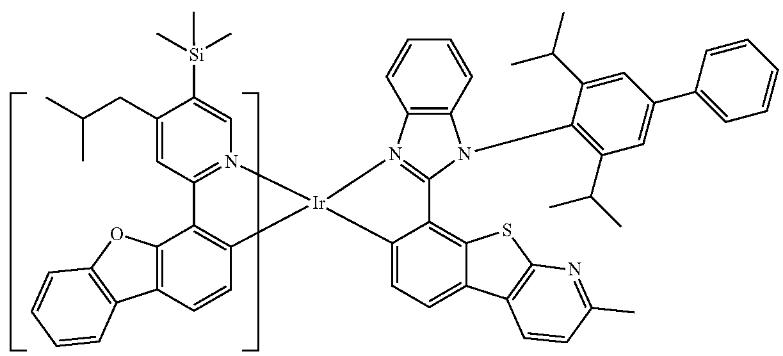
2609
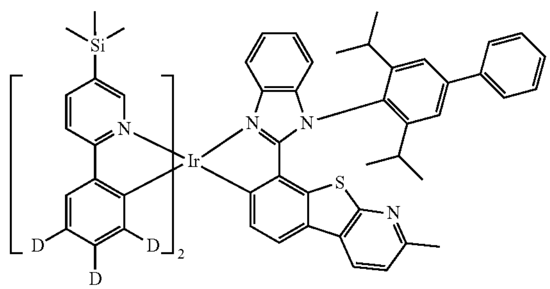
2610
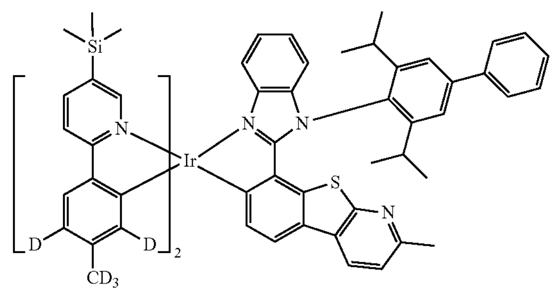

-continued
2611
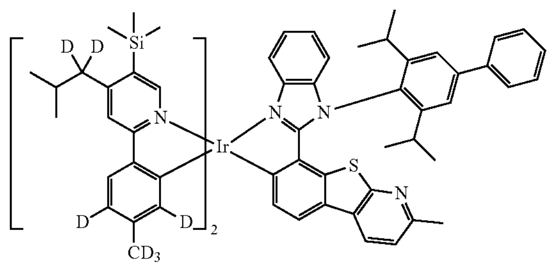
2612
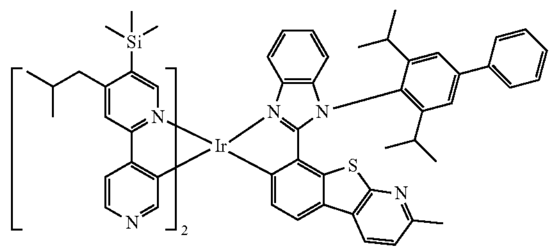
2613
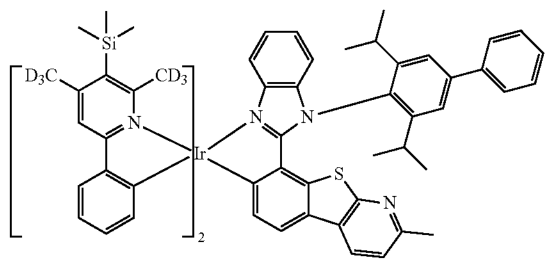
2614
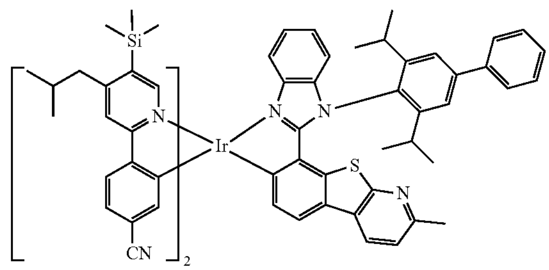
2615
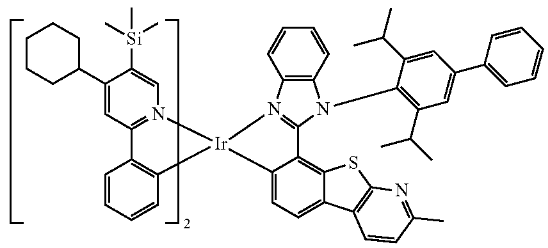
2616
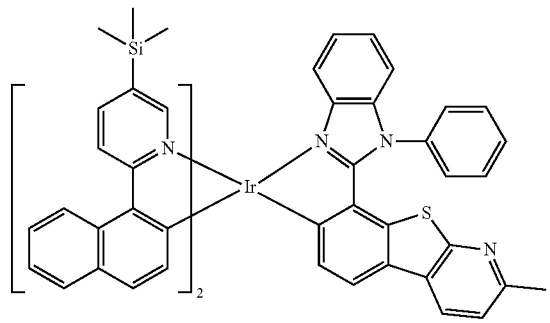
2617
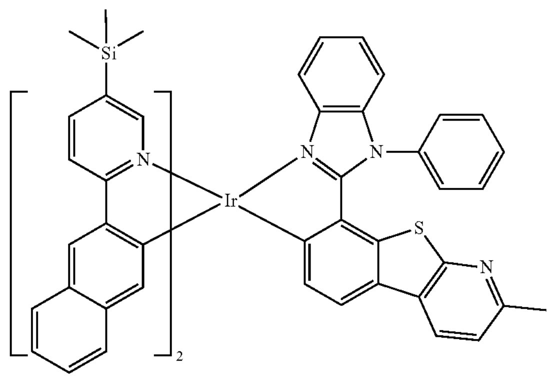
2618
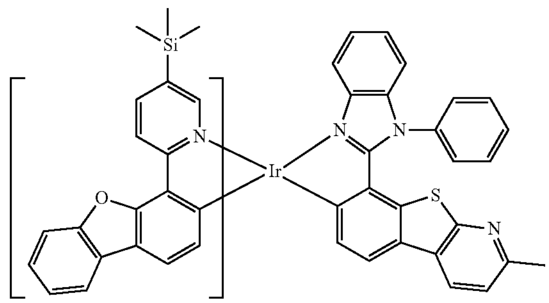
2619
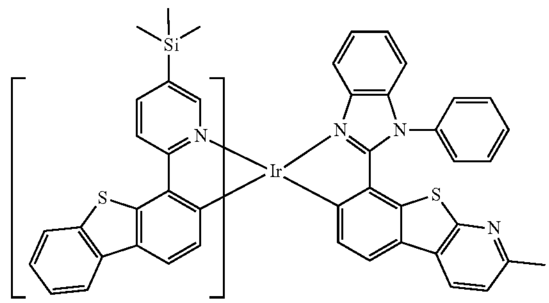

-continued
2620
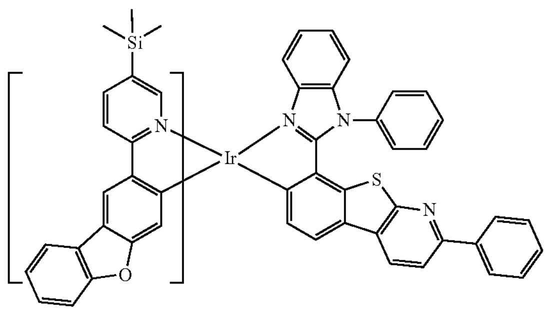
2621
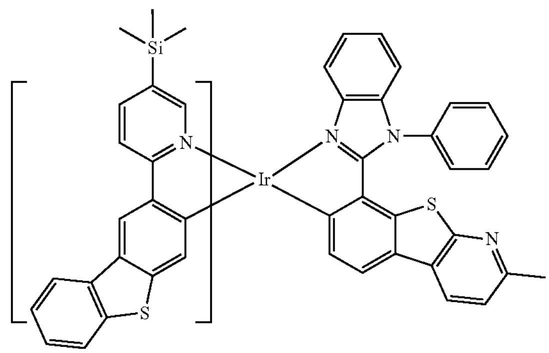
2622
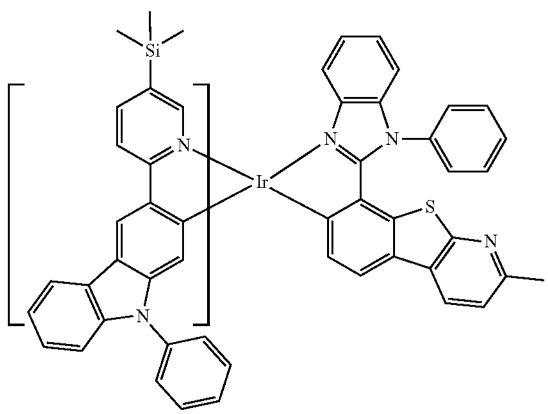
2623
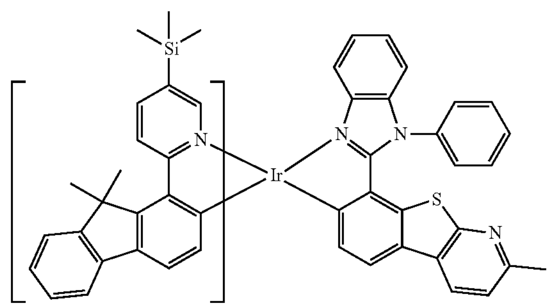
2624
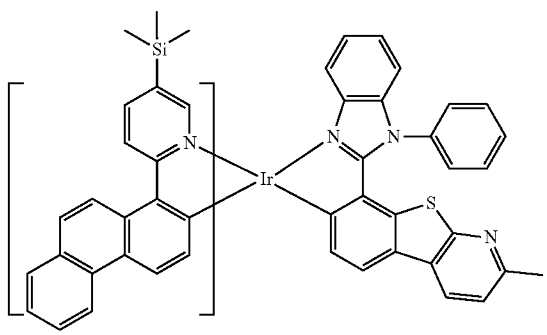
2625
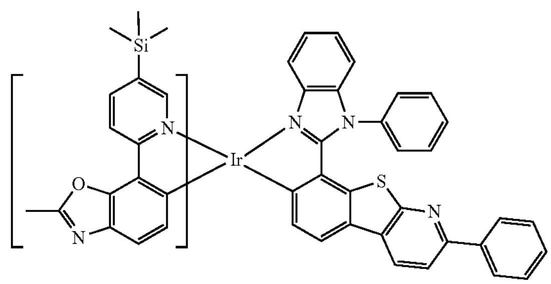
2626
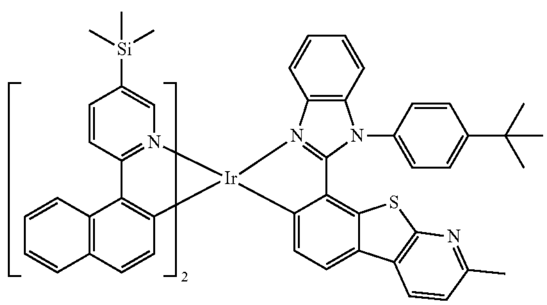
2627
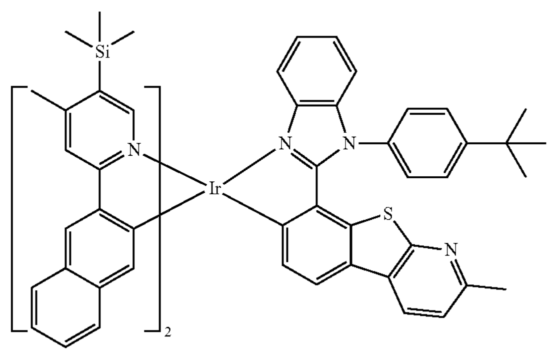

-continued
2628
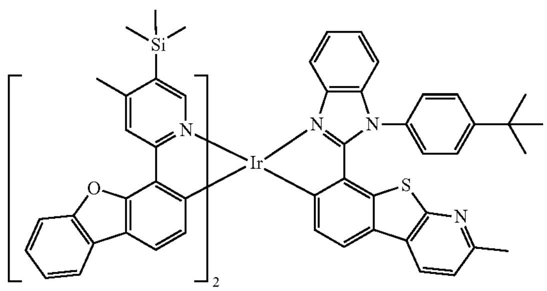
2629
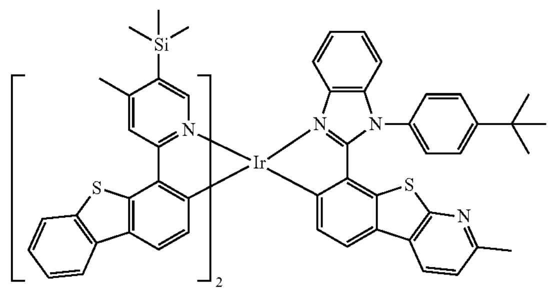
2630
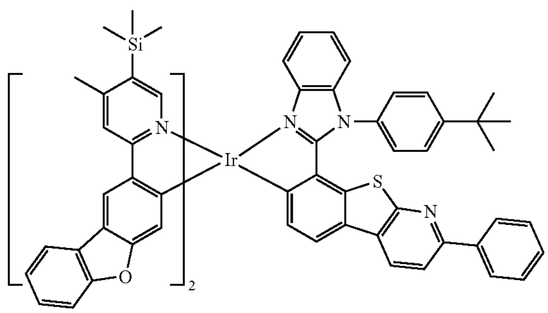
2631
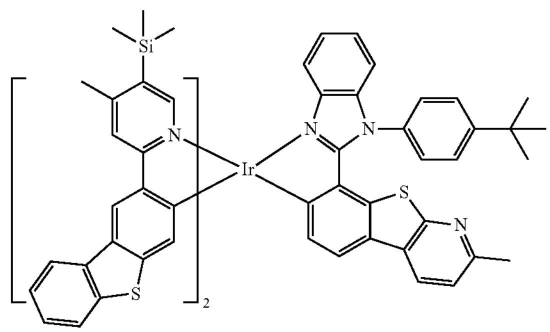
2632
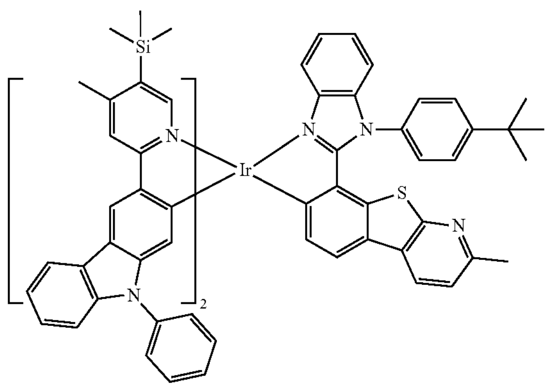
2633
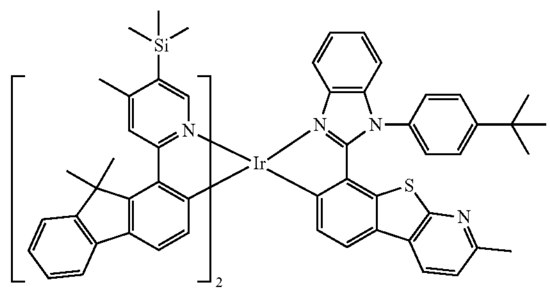
2634
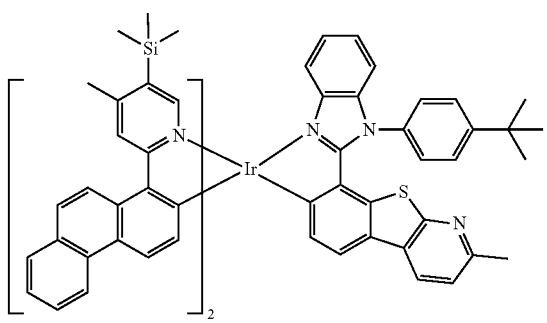
2635
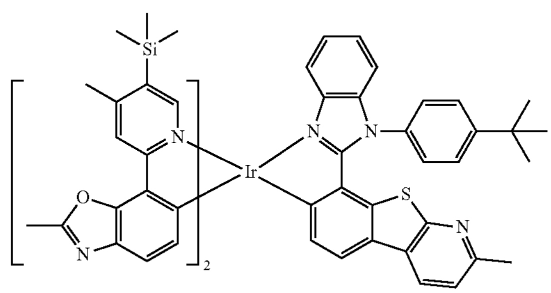

-continued
2636
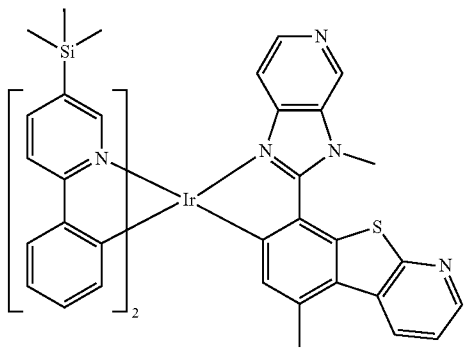
2637
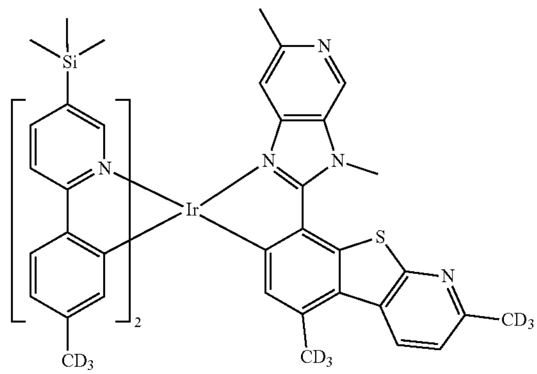
2638
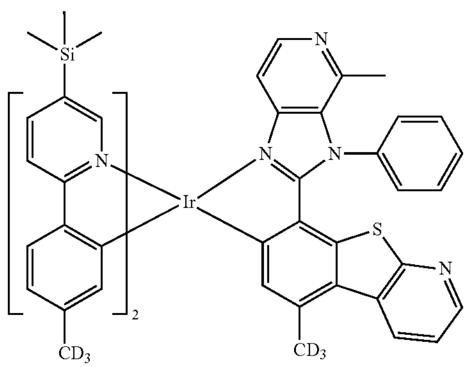
2639
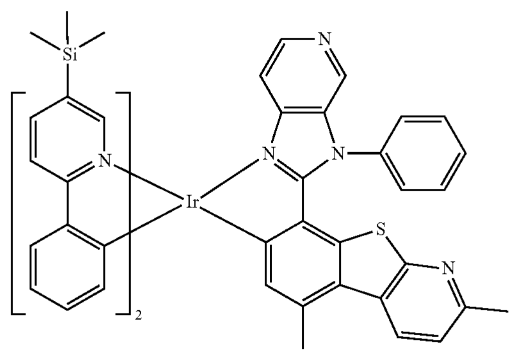
2640
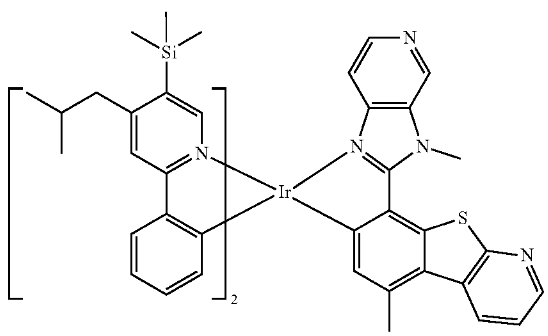
2641
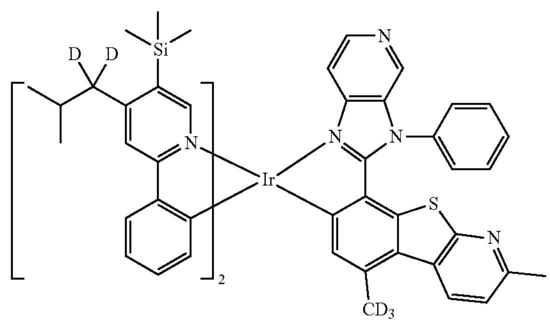
2642
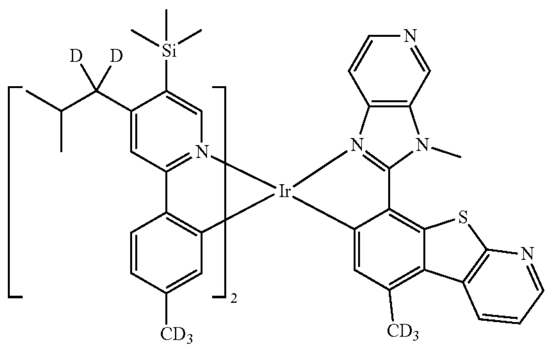
2643
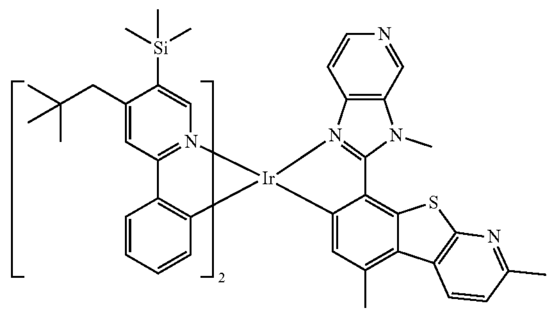

-continued
2644
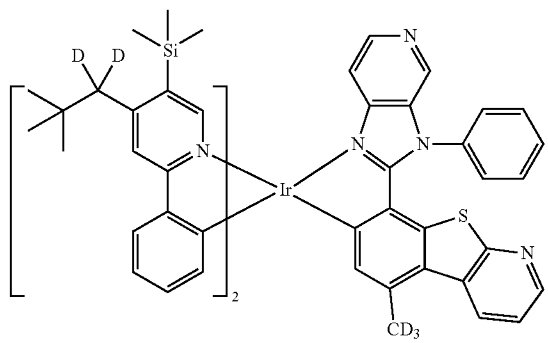
2645
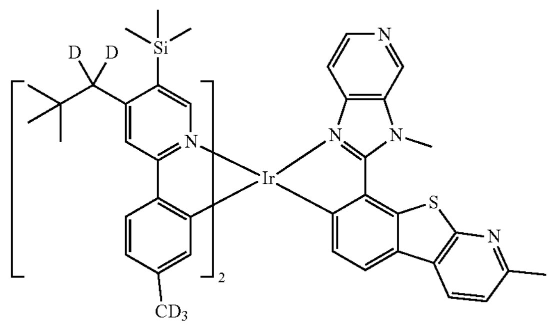
2646
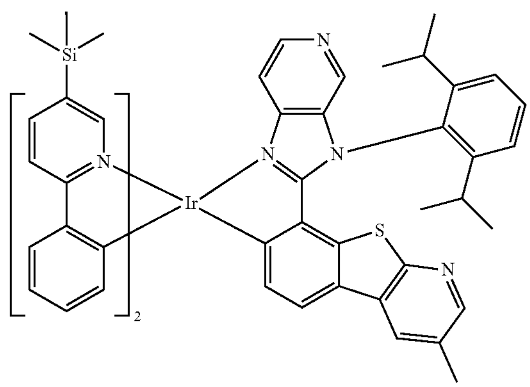
2647
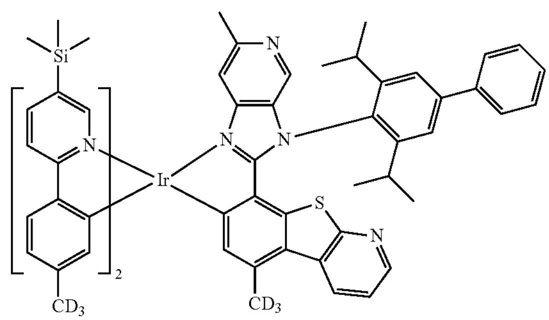
2648
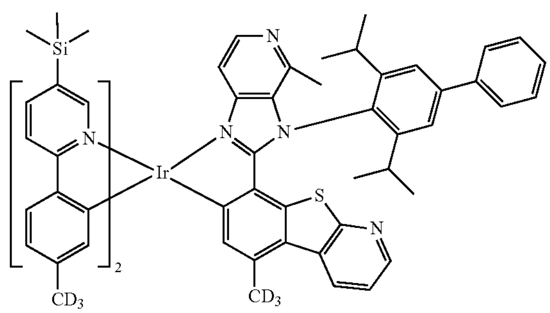
2649
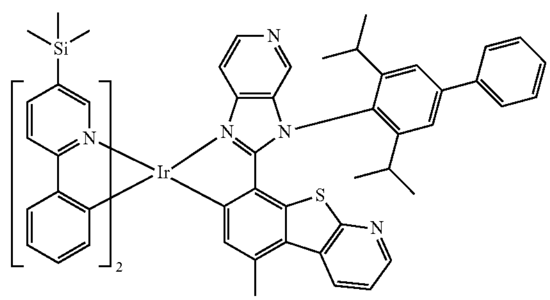
2650
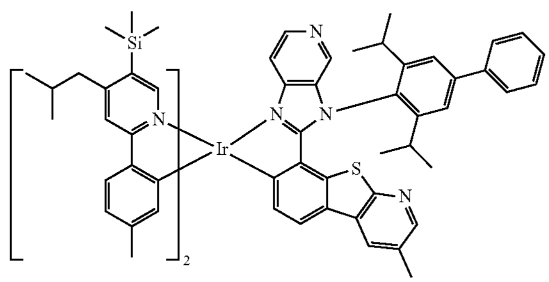
2651
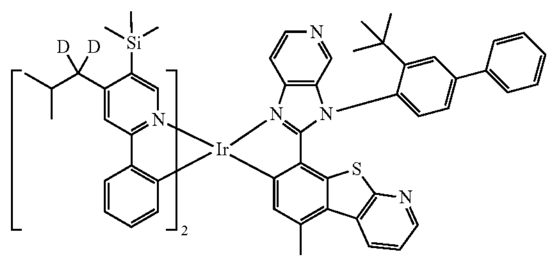

-continued
2652
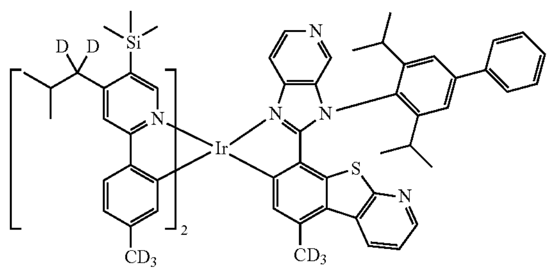
2653
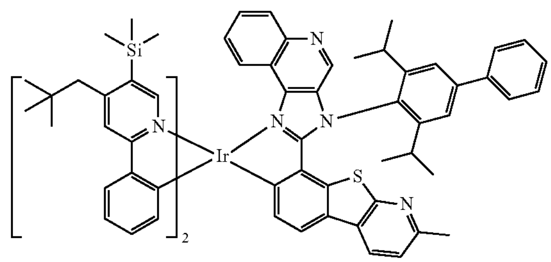
2651
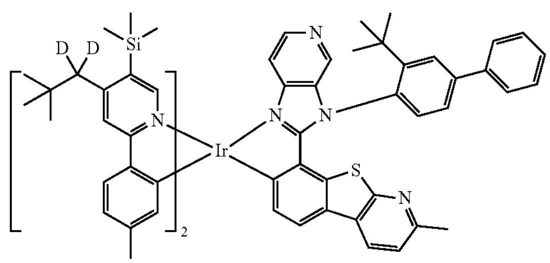
2655
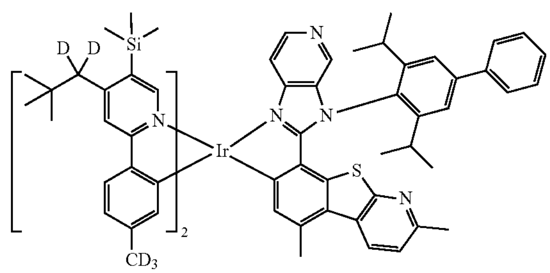
2656
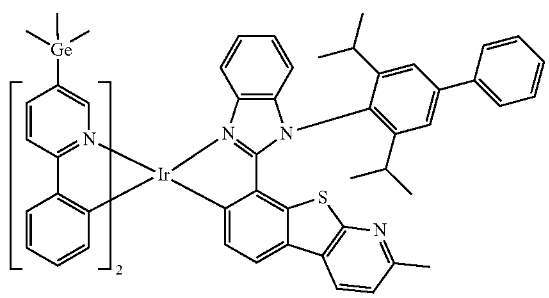
2657
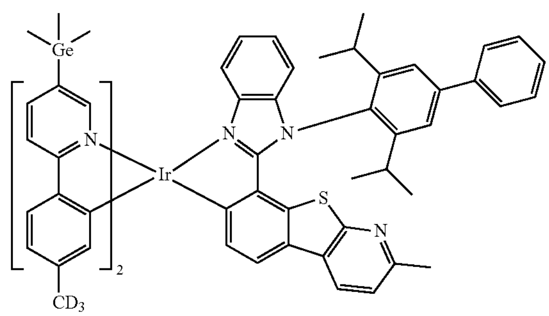
2658
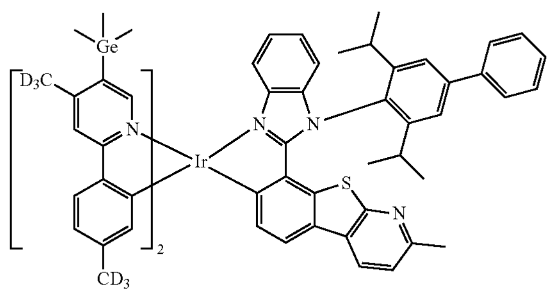
2659
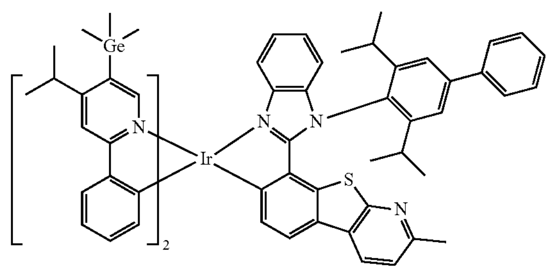
2660
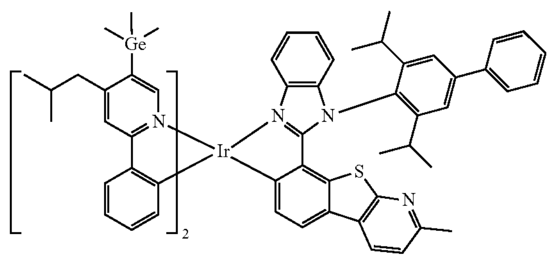
2661
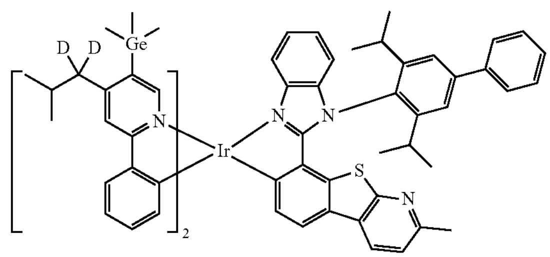

-continued
2662
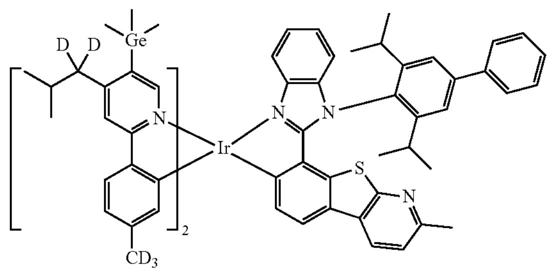
2663
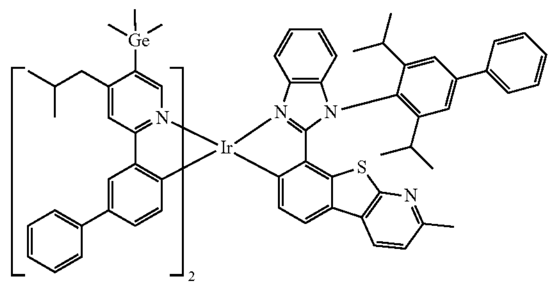
2664
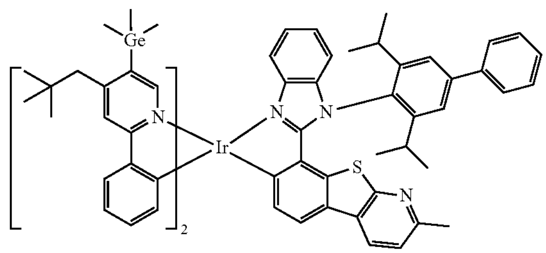
2665
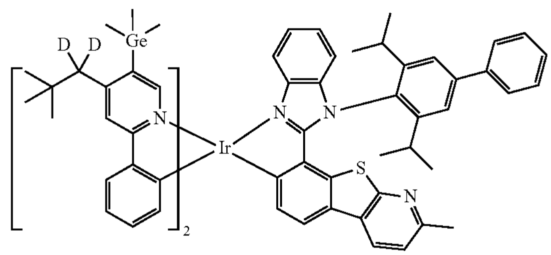
2666
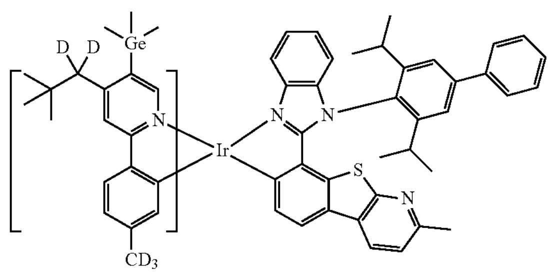
2667
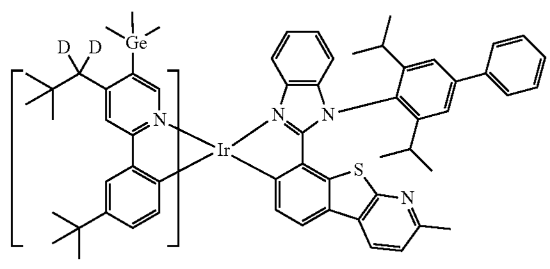
2668
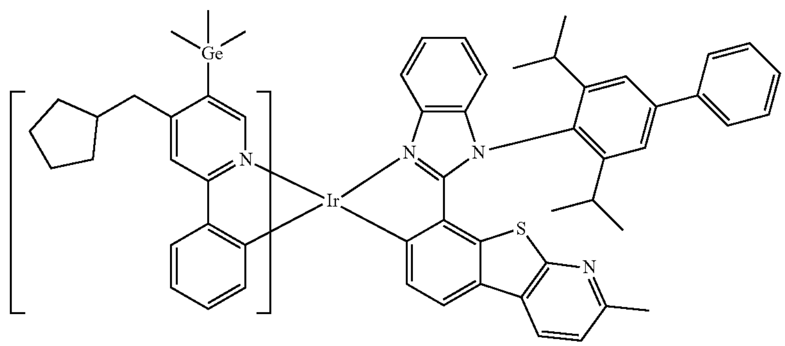
2669
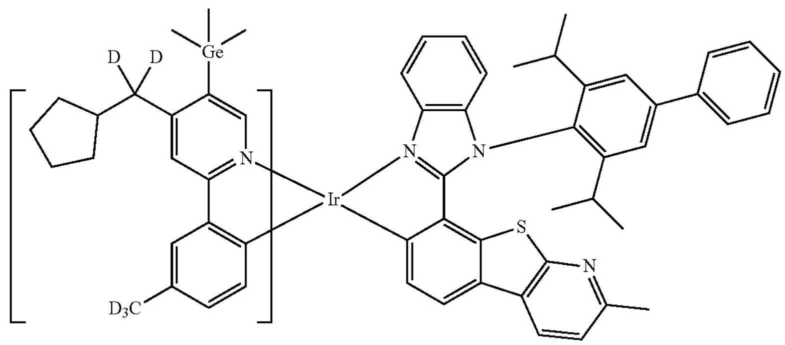

-continued
2670
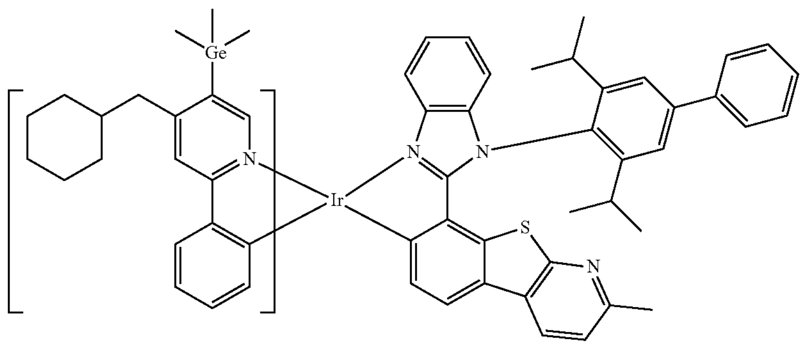
2671
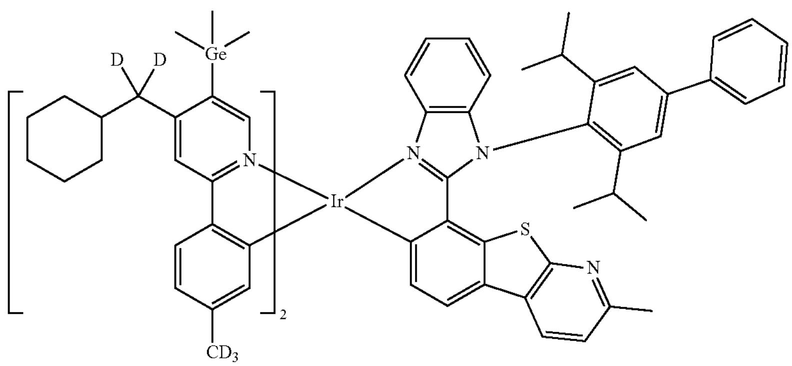
2672
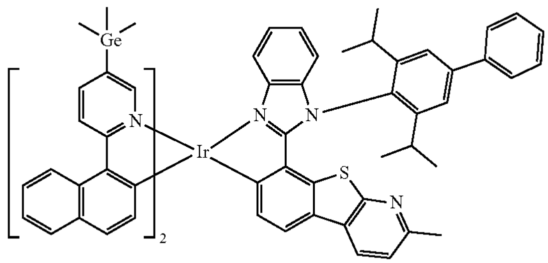
2673
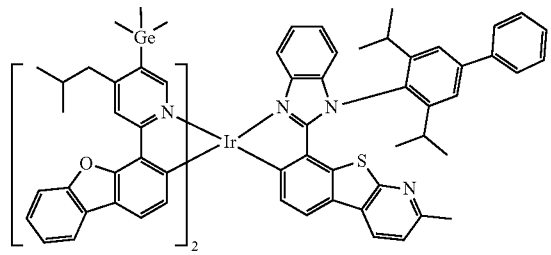
2674
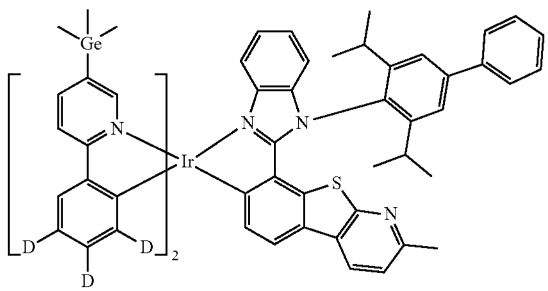
2675
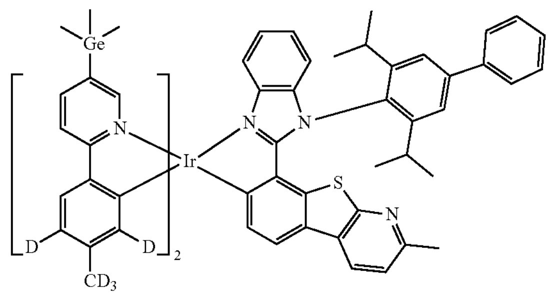
2676
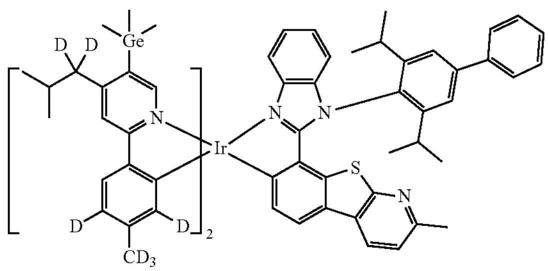
2677
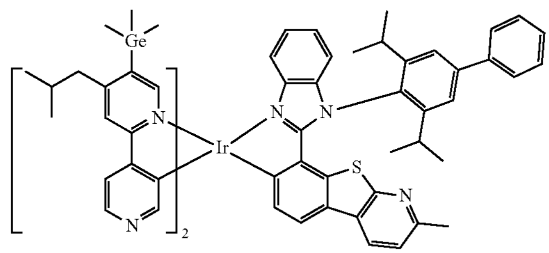

-continued
2678
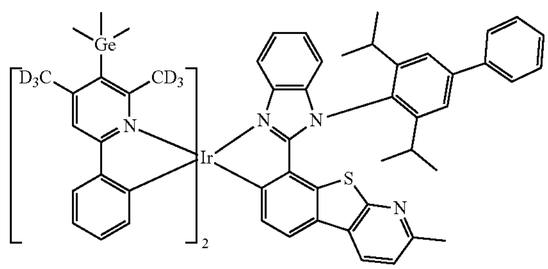
2679
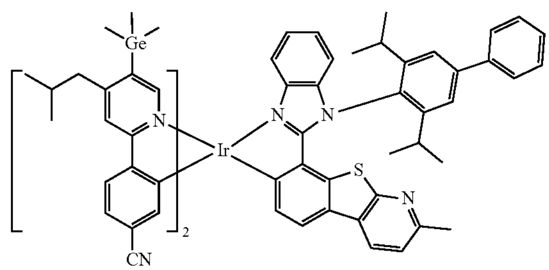
2680
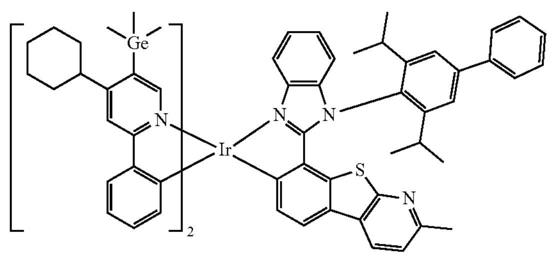
2681
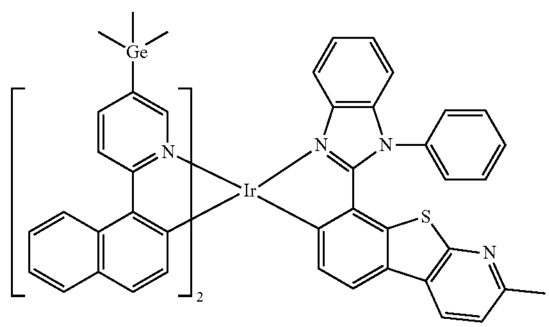
2682
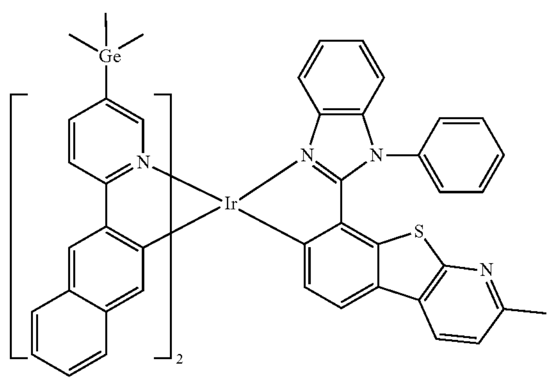
2683
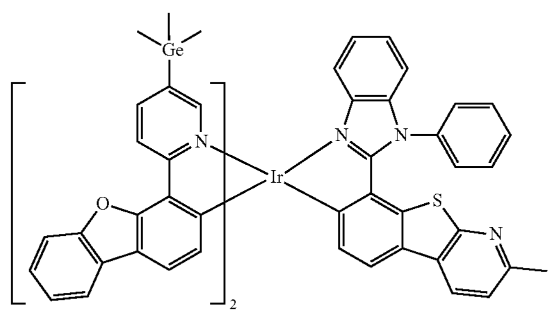
2684
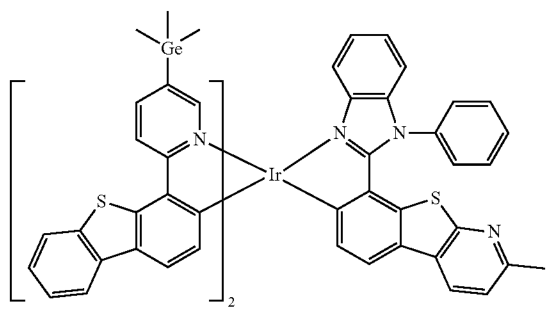
2685
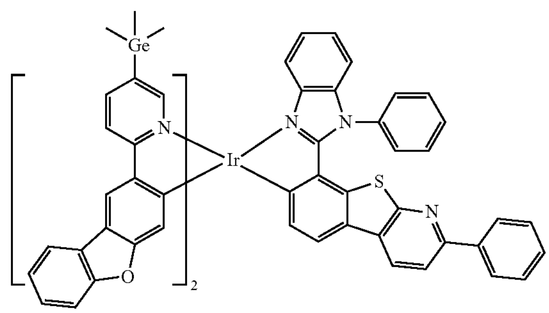

-continued
2686
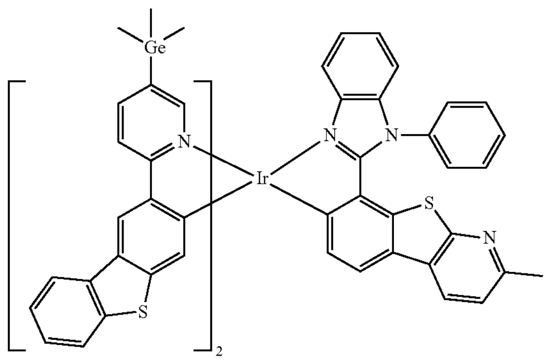
2687
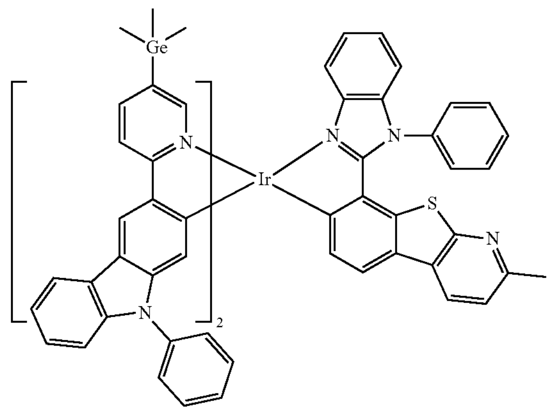
2688
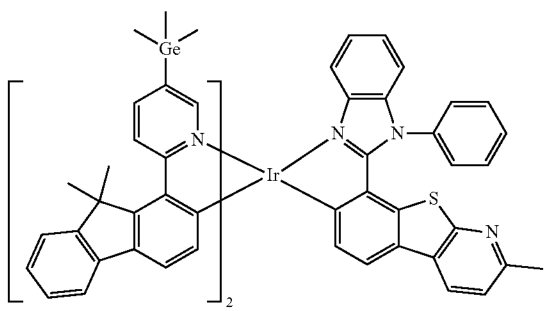
2689
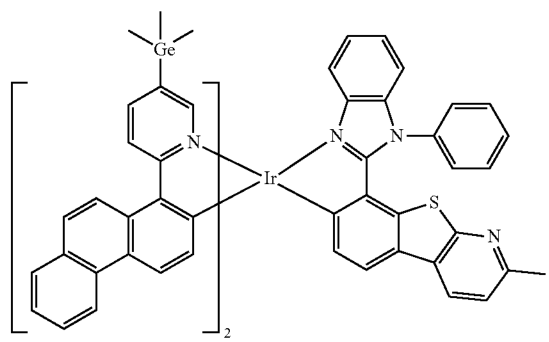
2690
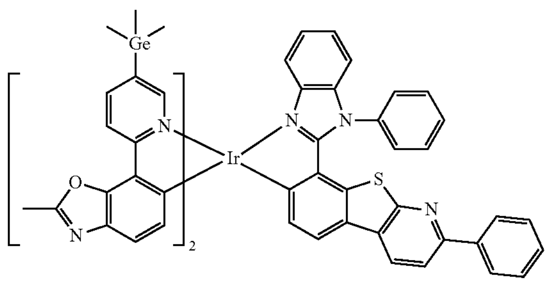
2691
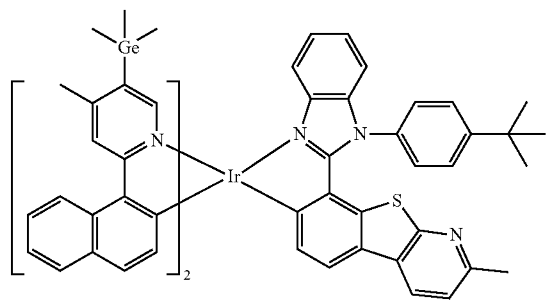
2692
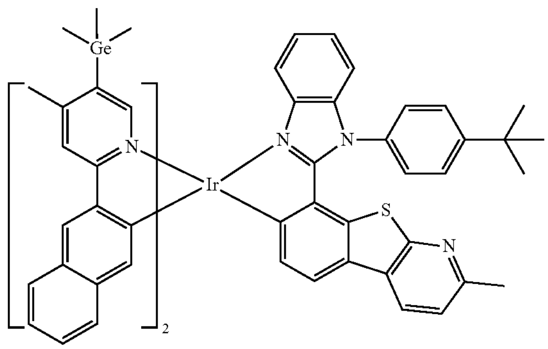
2693
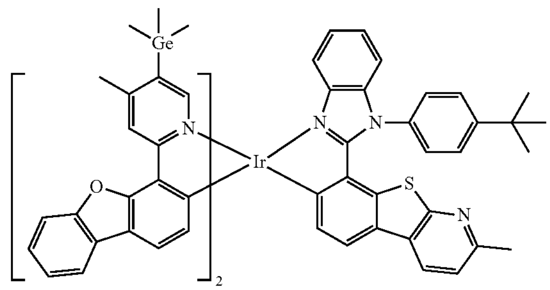

-continued
2694
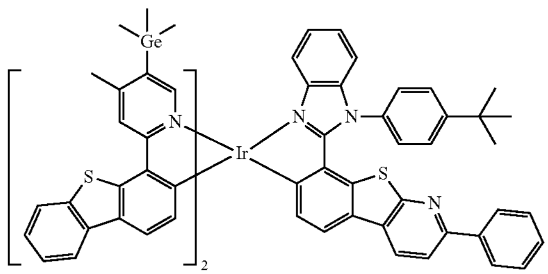
2695
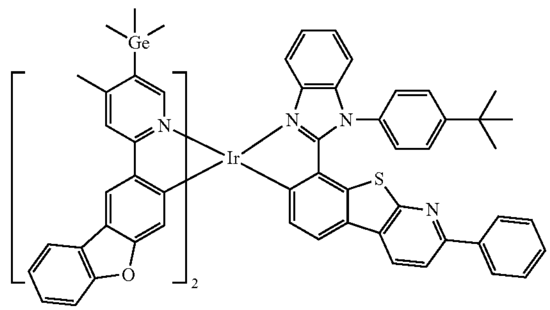
2696
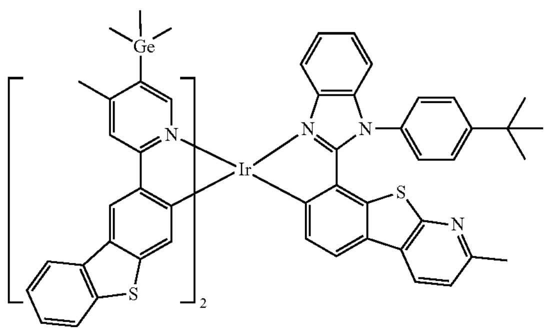
2697
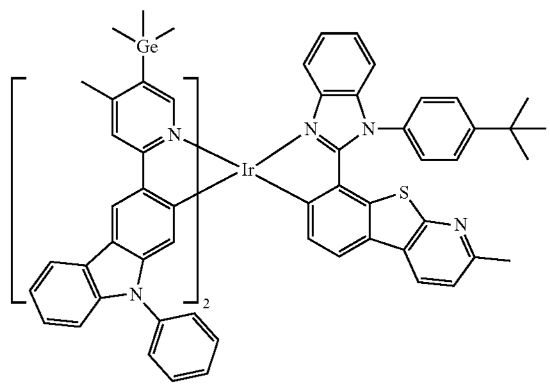
2698
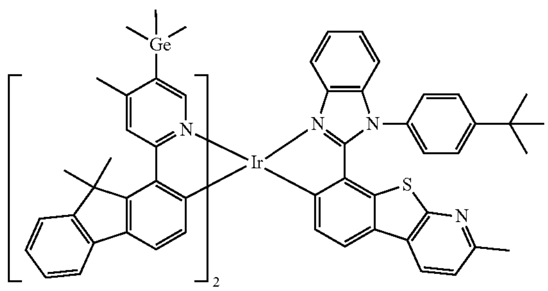
2699
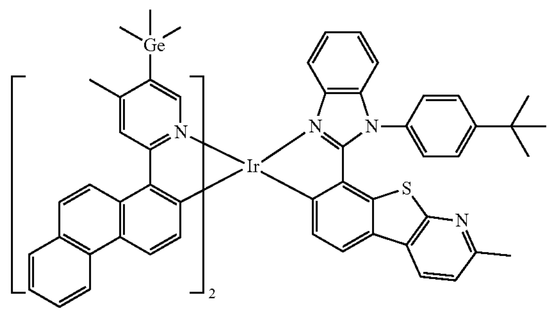
2700
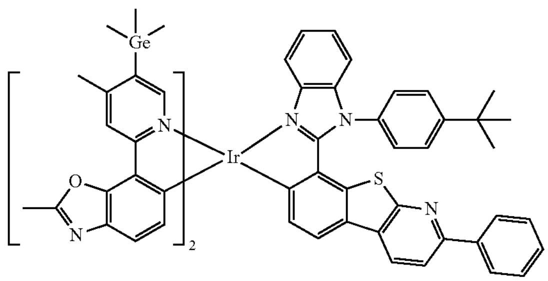
2701
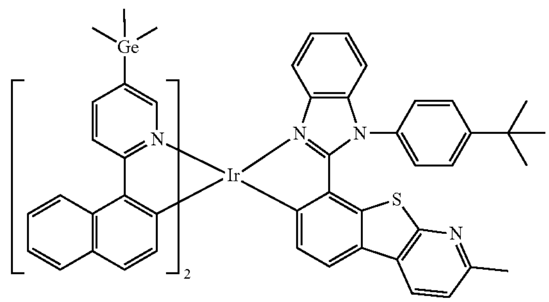

-continued
2702
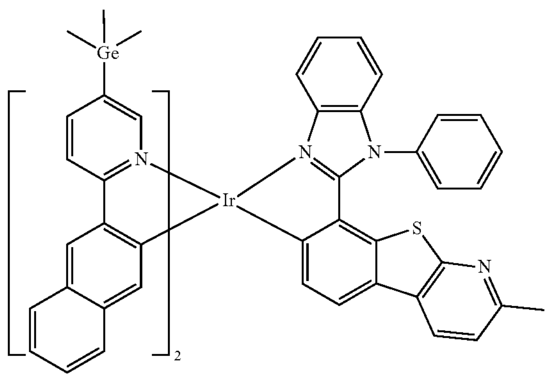
2703
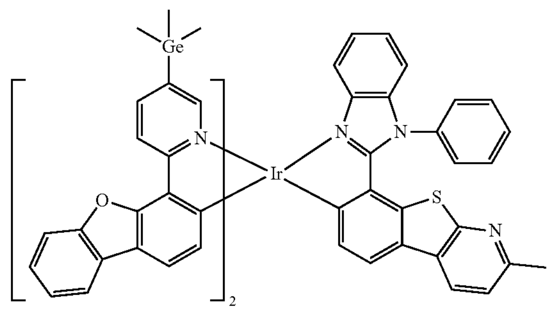
2704
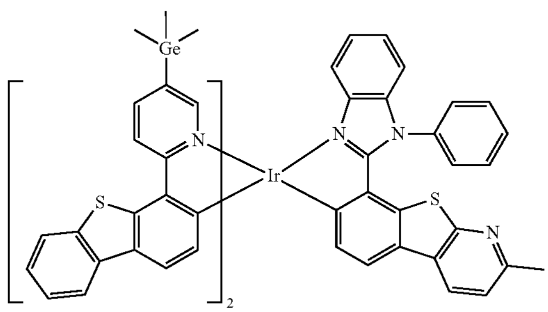
2705
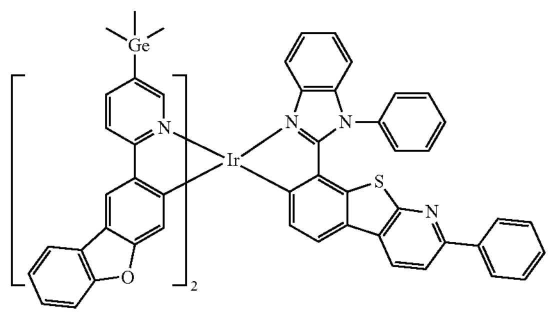
2706
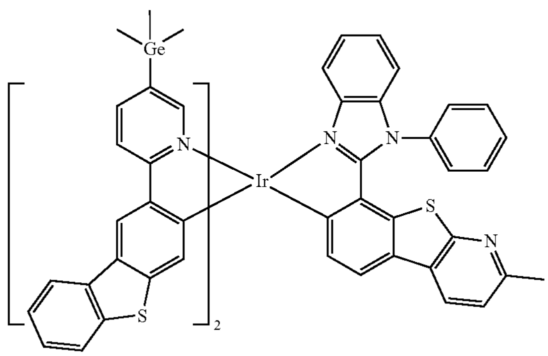
27707
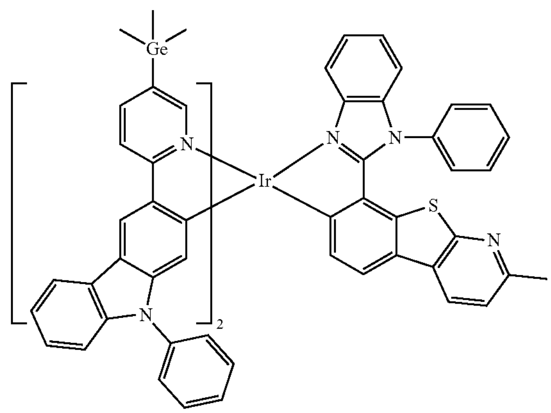
2708
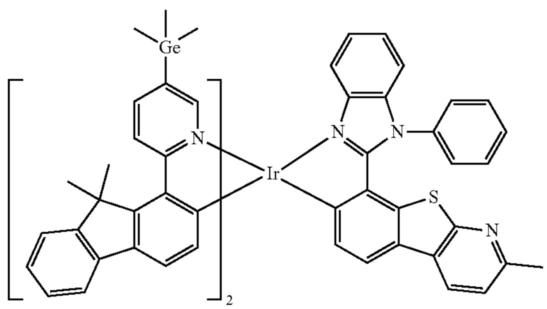
2709
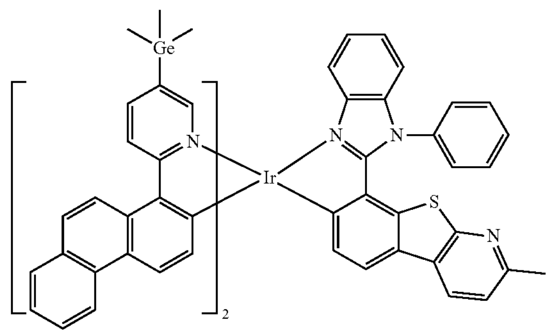

-continued
2710
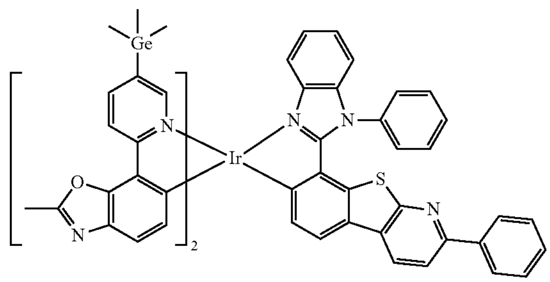
2711
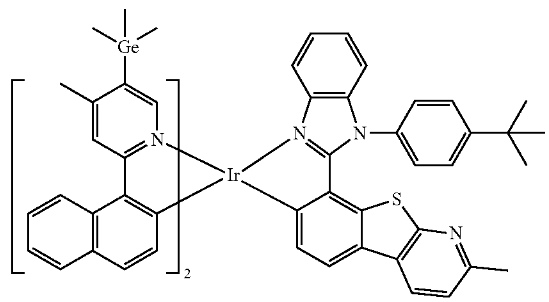
2712
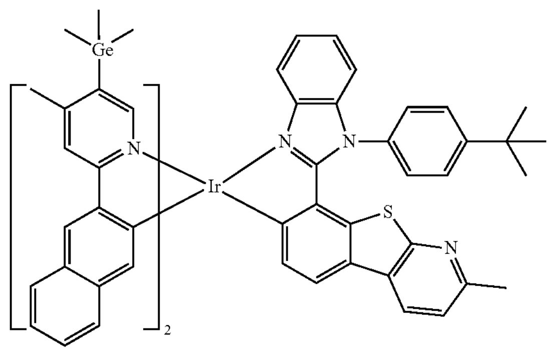
2713
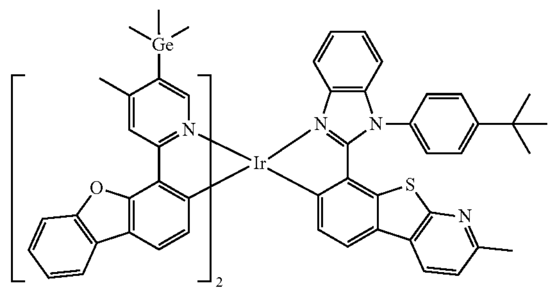
2714
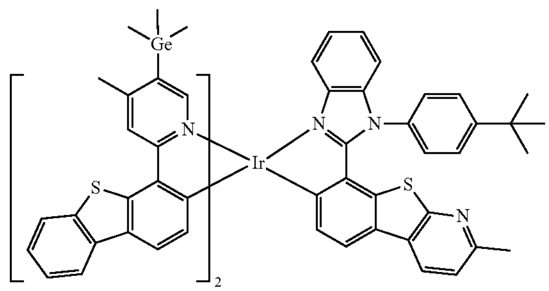
2715
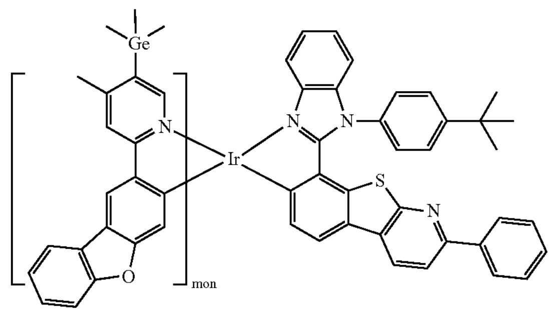
2716
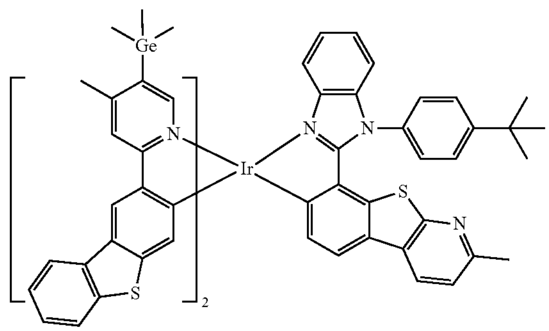
2717
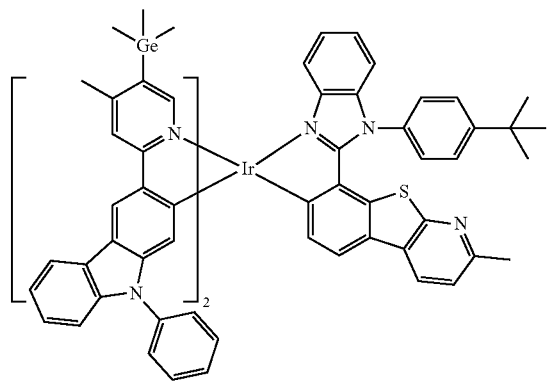

-continued
2718
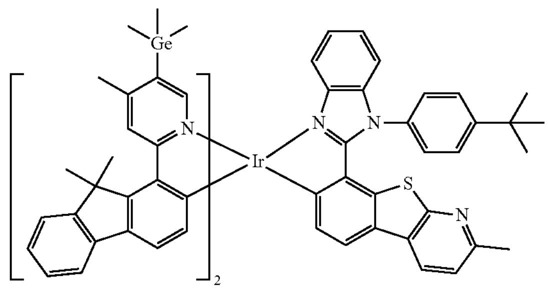
2719
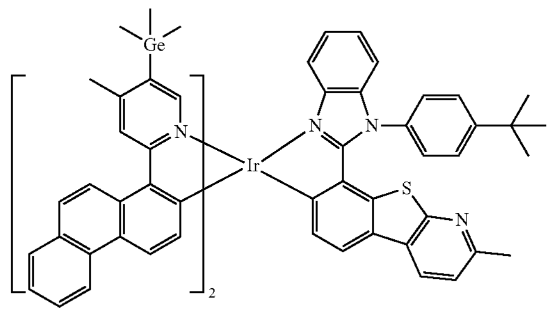
2720
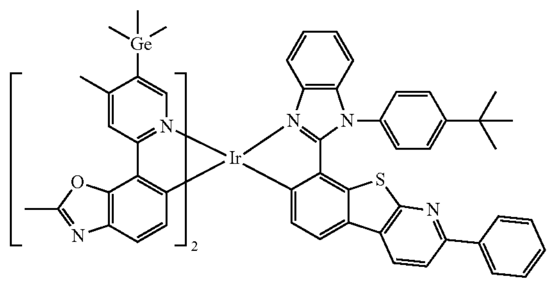
2721
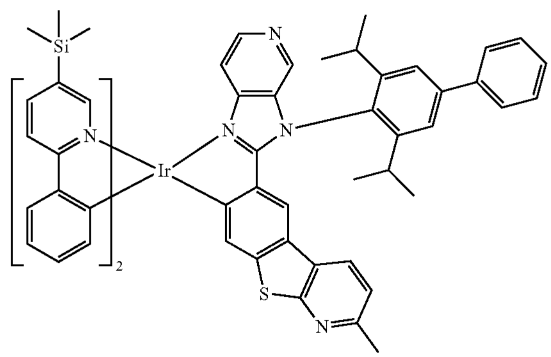
2722
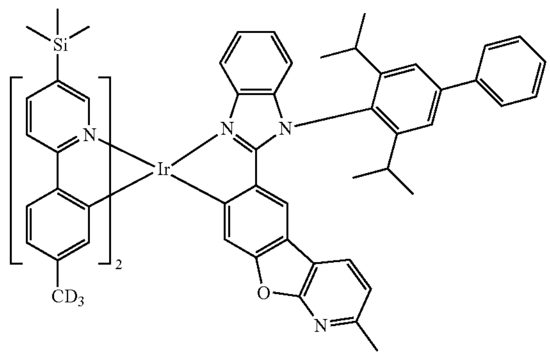
2723
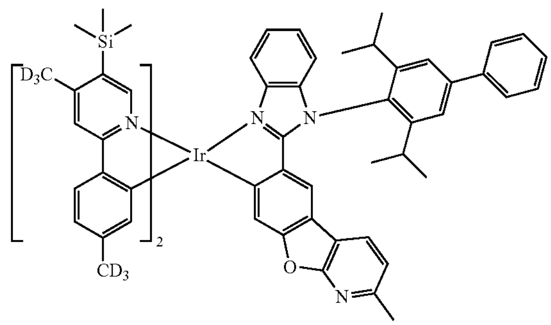
2724
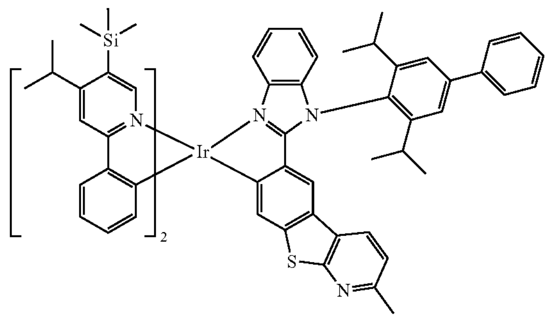
2725
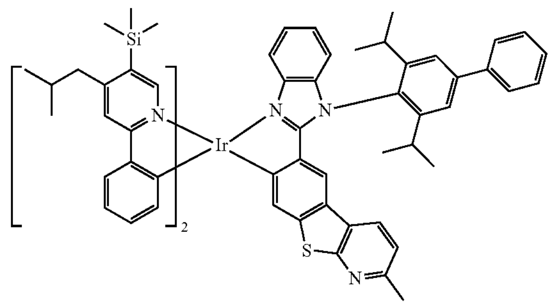

-continued
2726
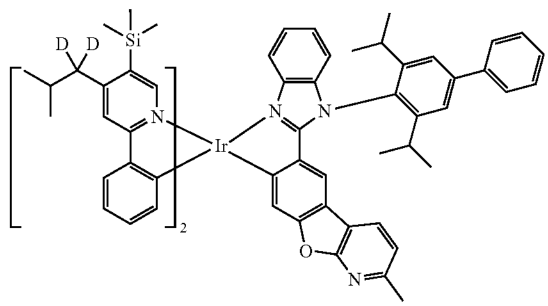
2727
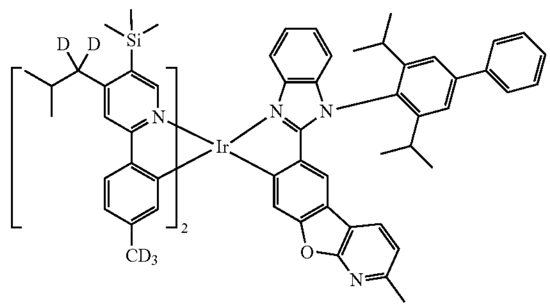
2728
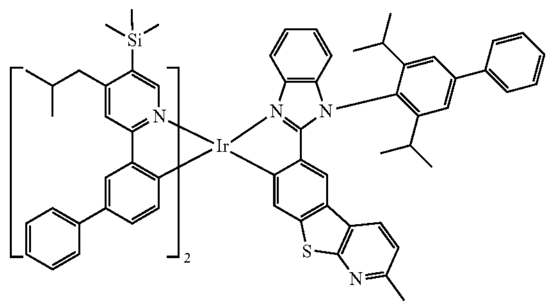
2729
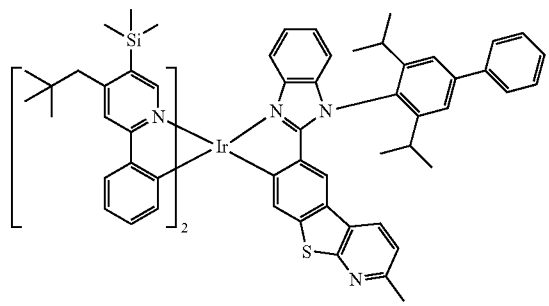
2730
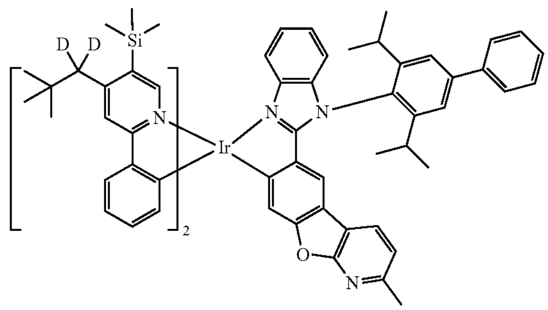
2731
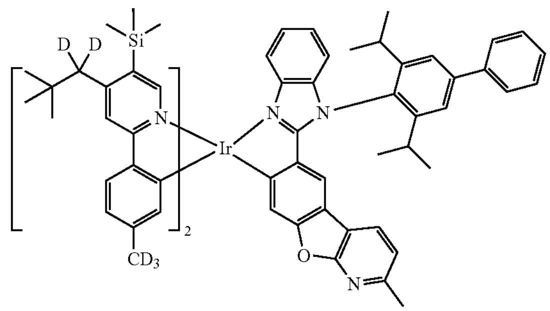
2732
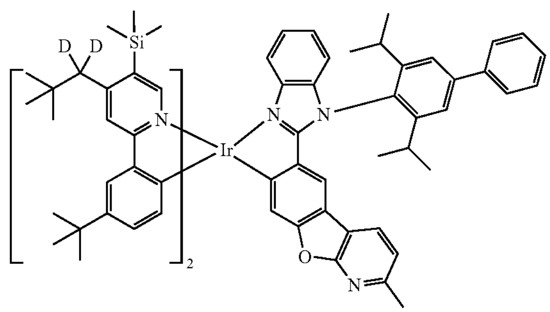
2733
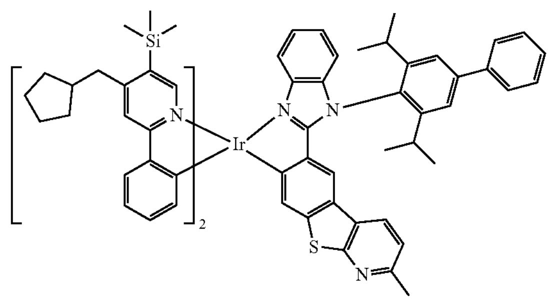

-continued
2734
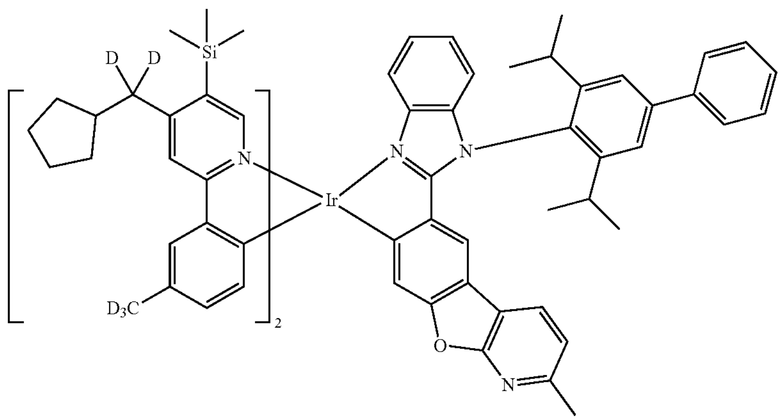
2735
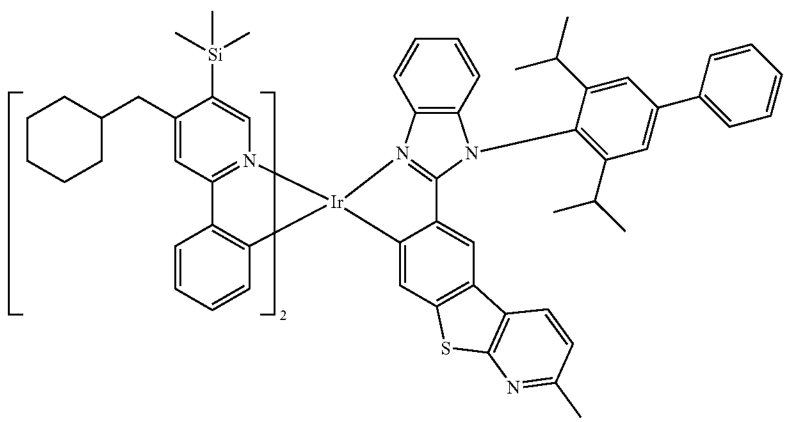
2736
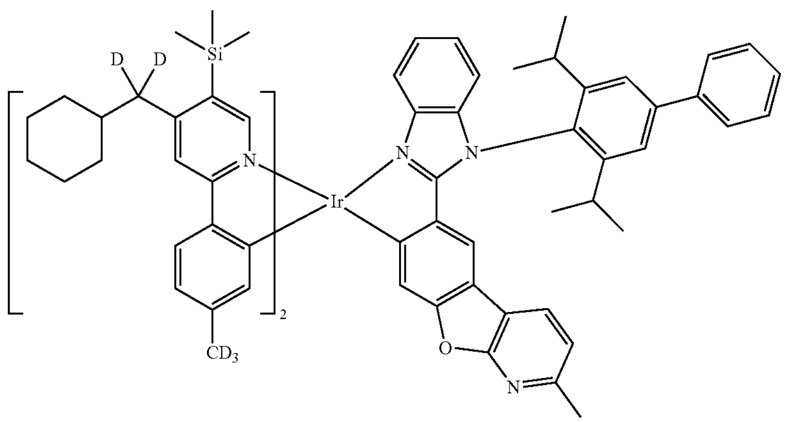
2737
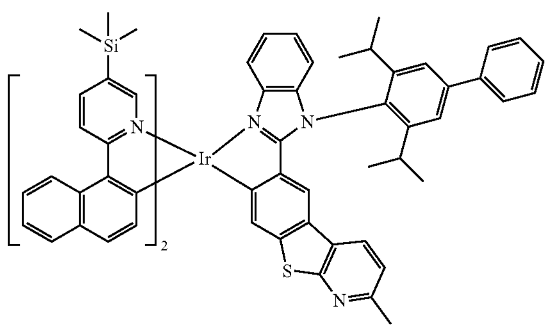
2738
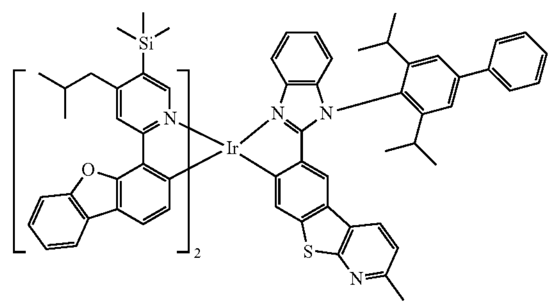

-continued
2739
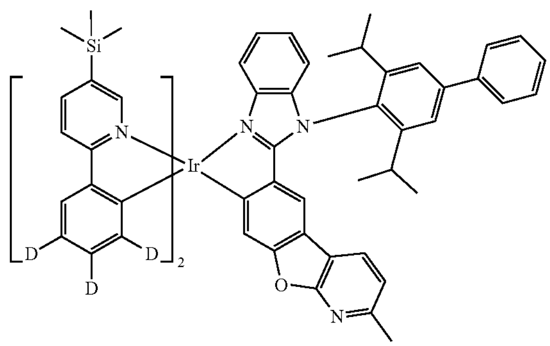
2740
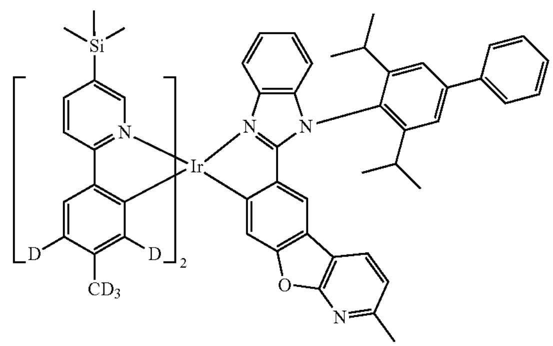
2741
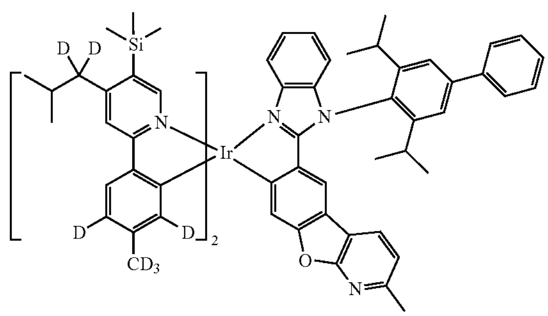
2742
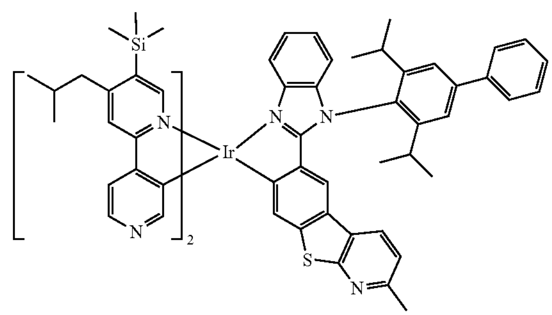
2743
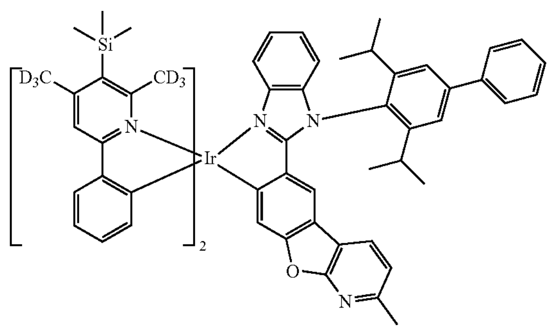
2744
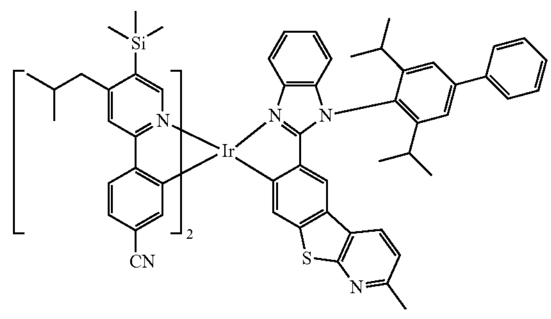
2745
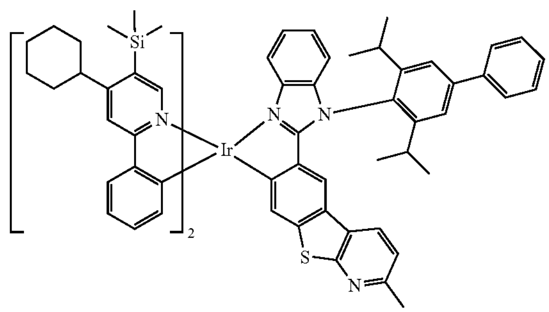
2746
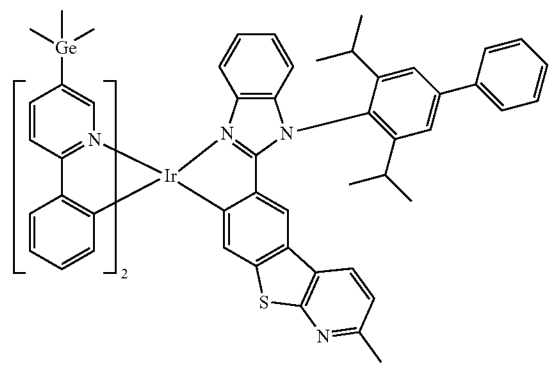

-continued
2747
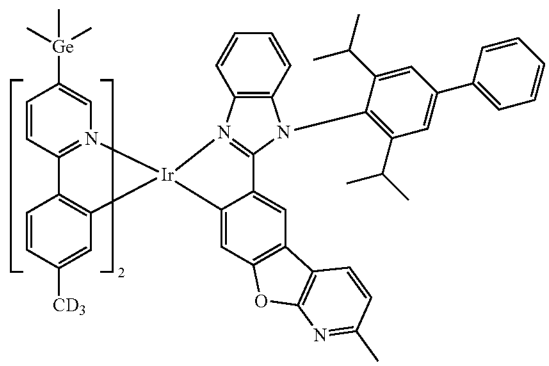
2748
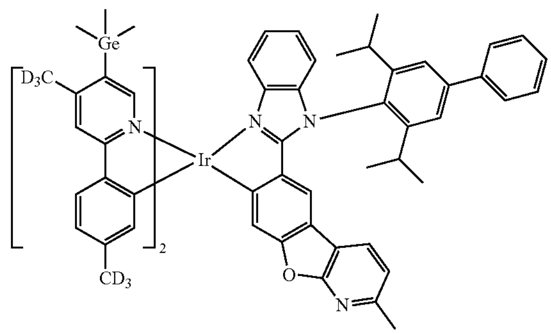
2749
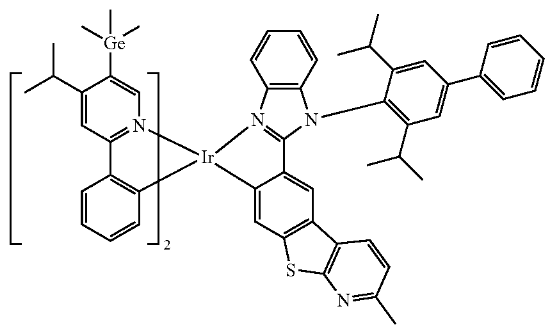
2750
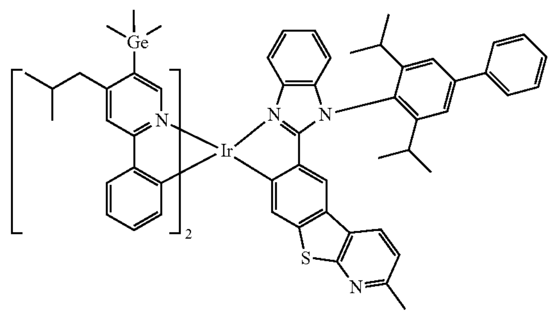
2751
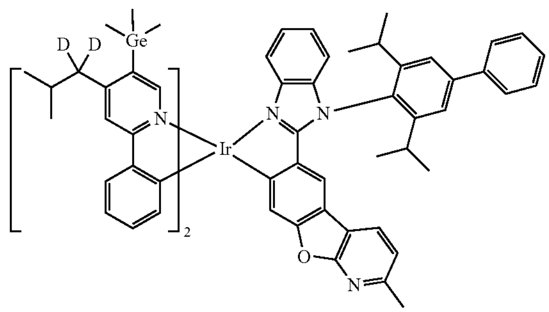
2752
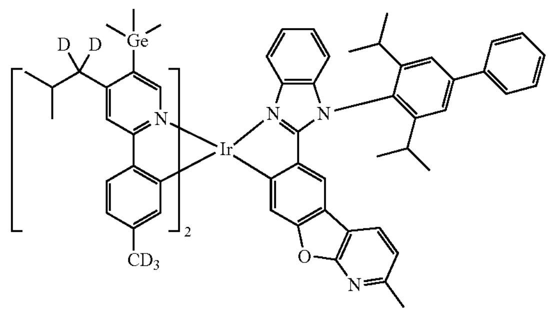
2753
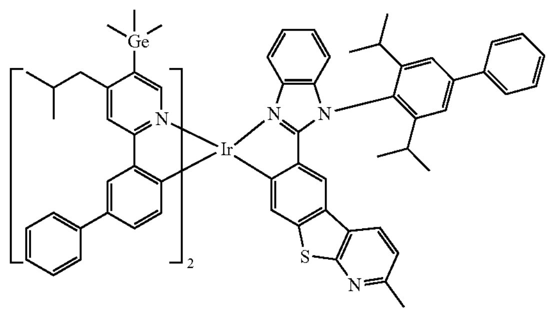
2754
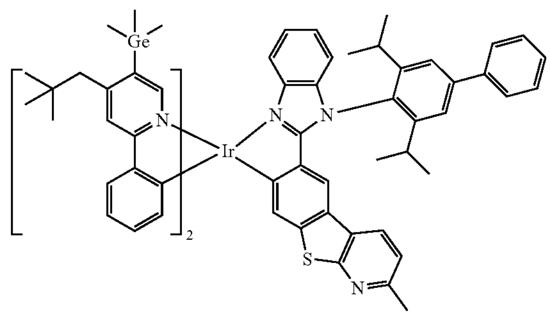

-continued
2755
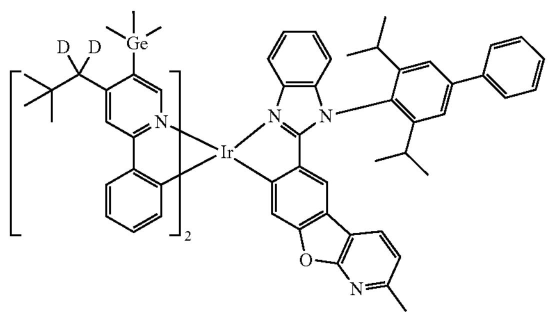
2756
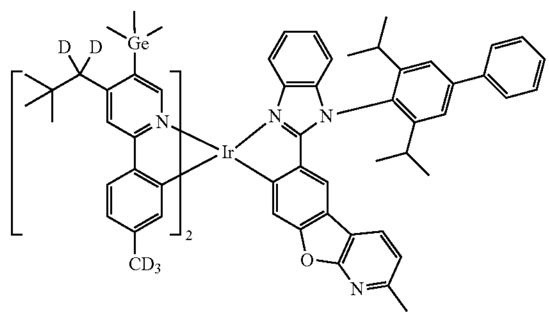
2757
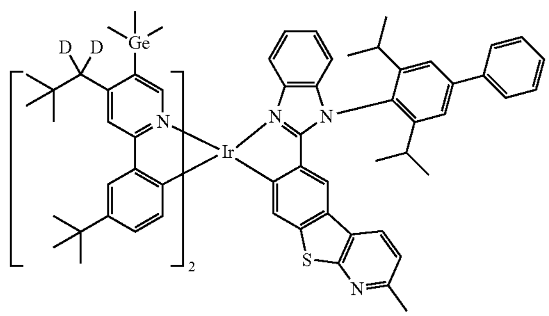
2758
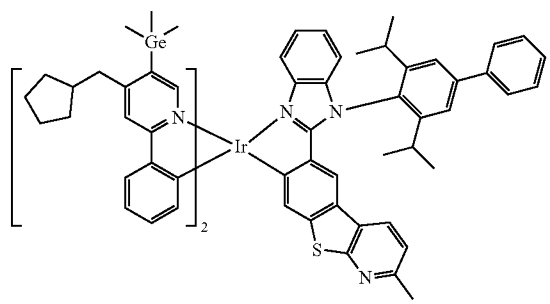
2759
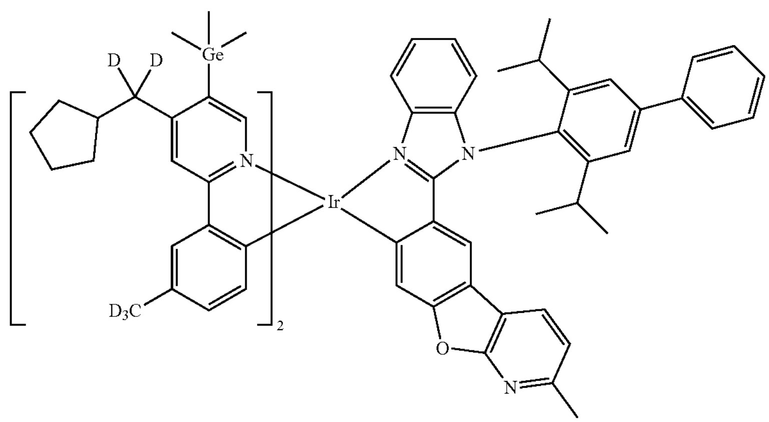
2760
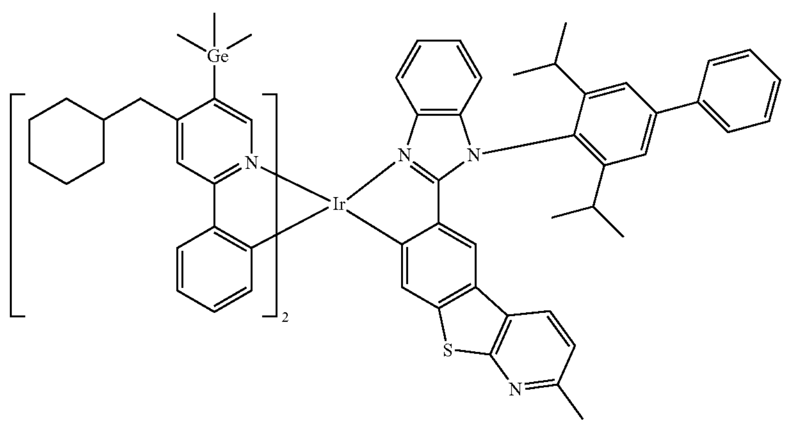

-continued
2761
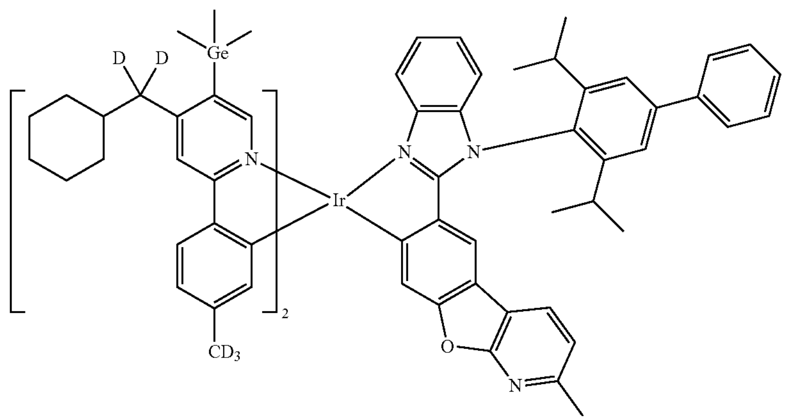
2762
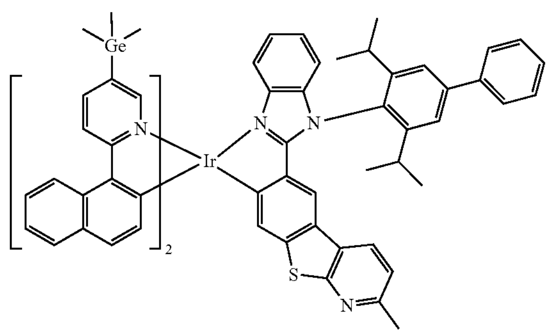
2763
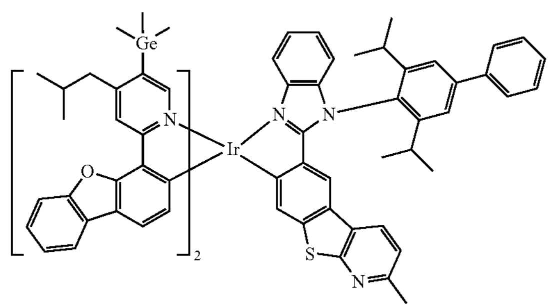
2764
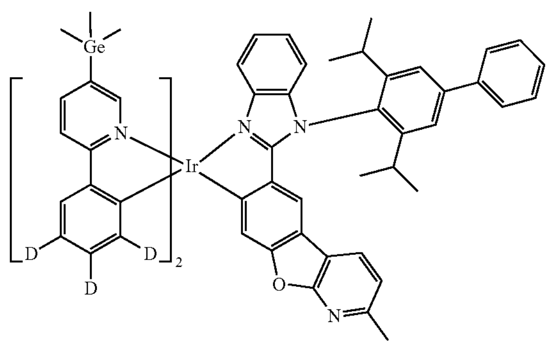
2765
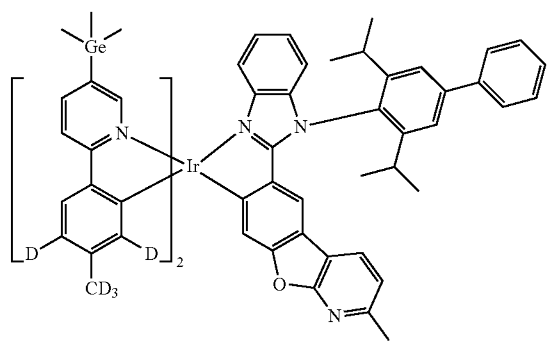
2766
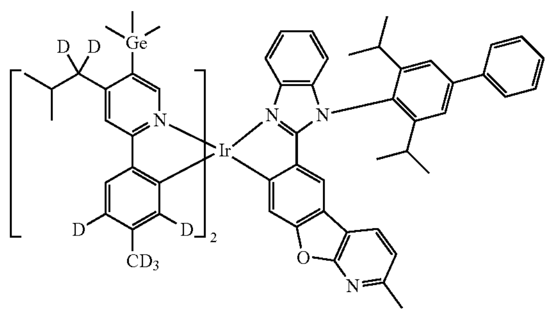
2767
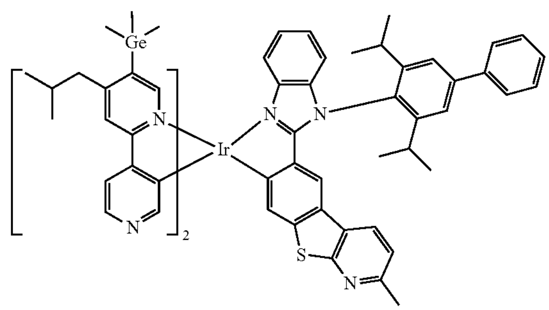

-continued
2768
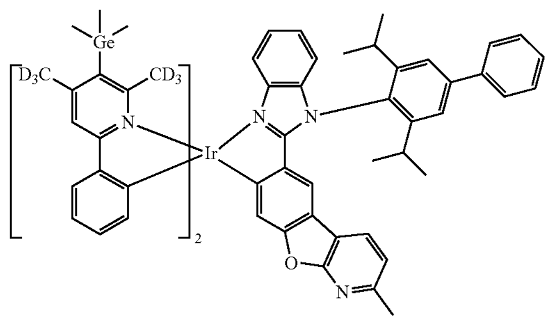
2769
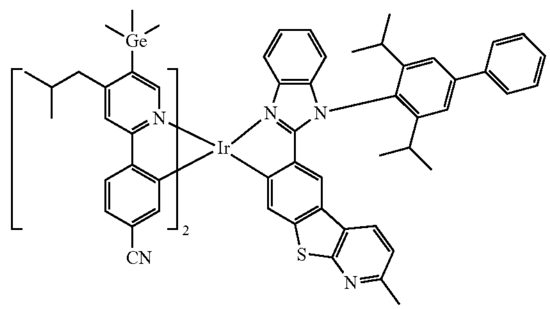
2770
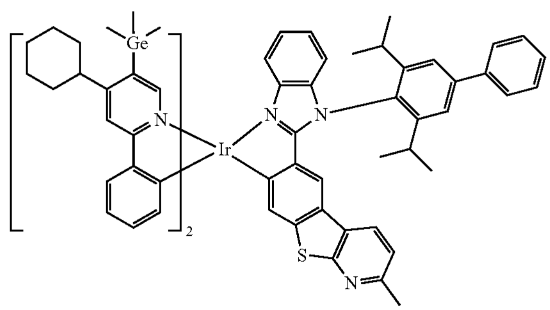
2771
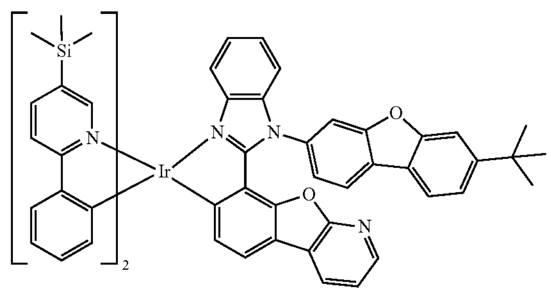
2772
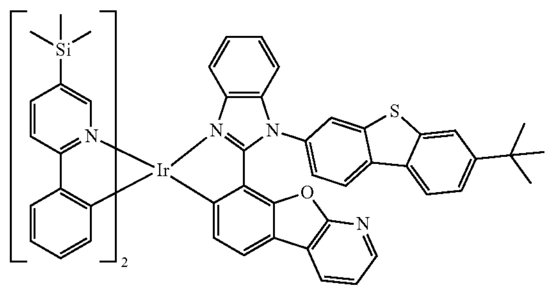
2773
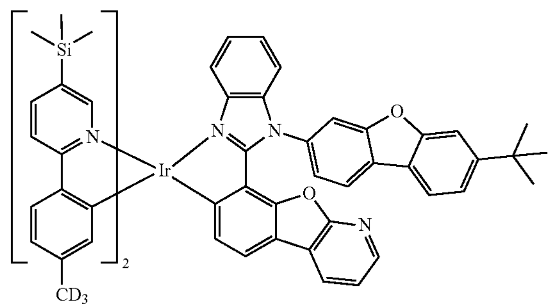
2774
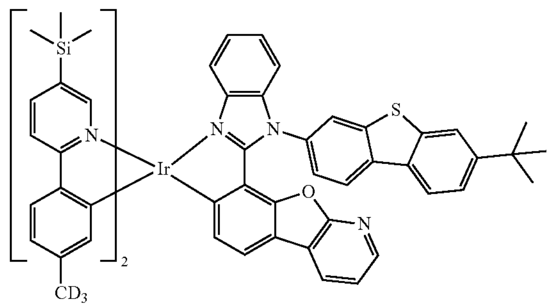
2775
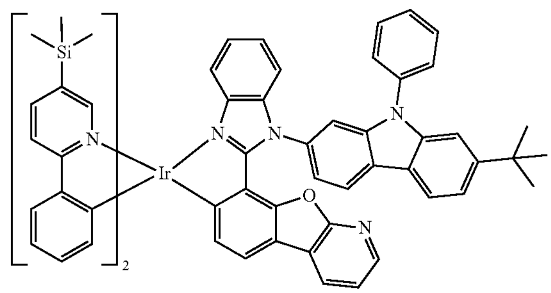
2776
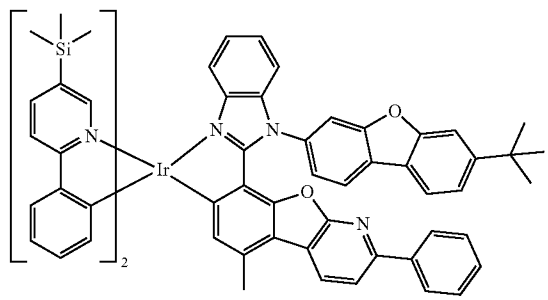
2777
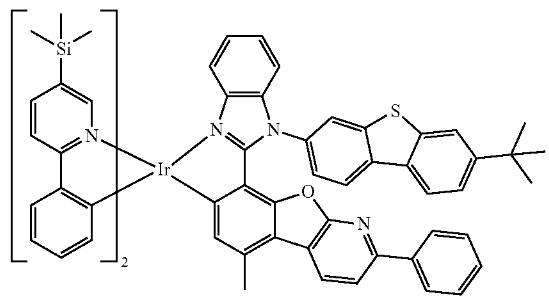

-continued
2778
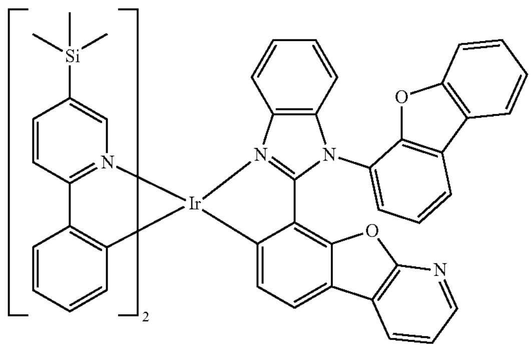
2779
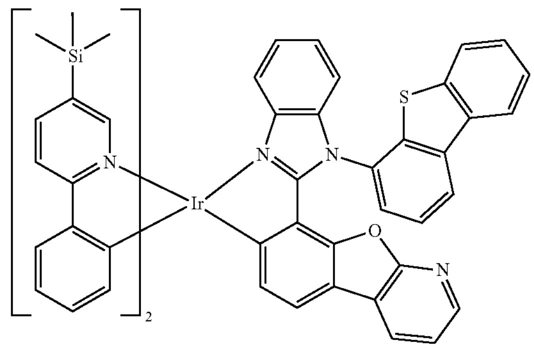
2780
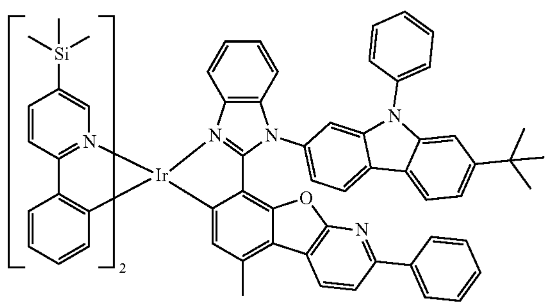
2781
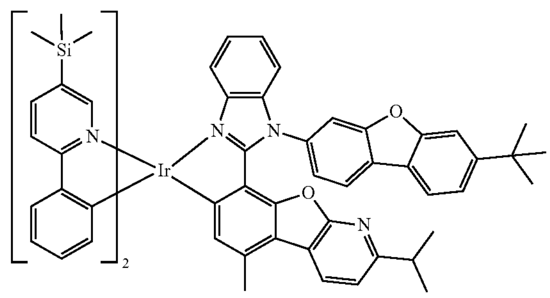
2782
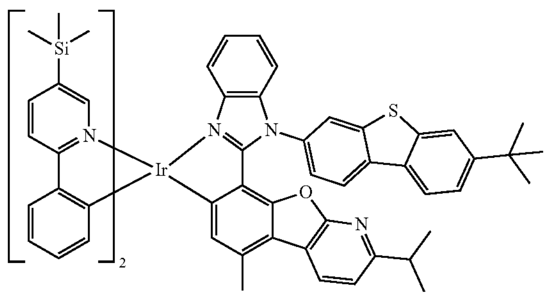
2783
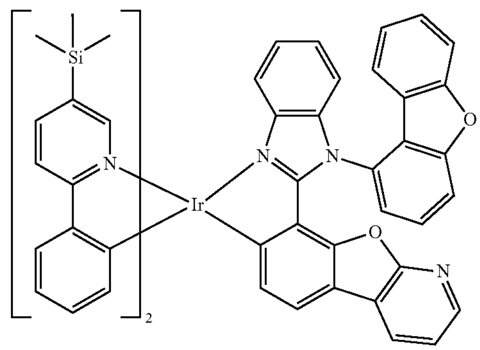
2784
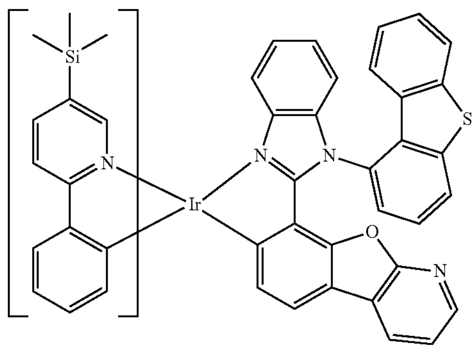
2785
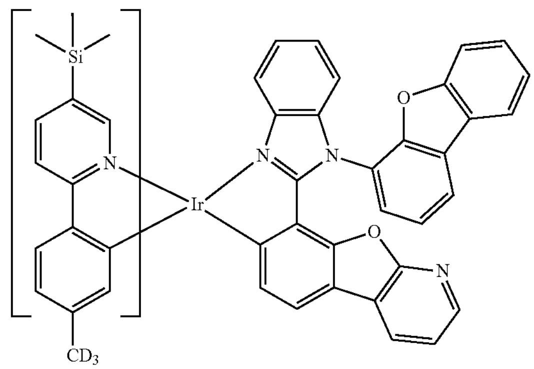

-continued
2786
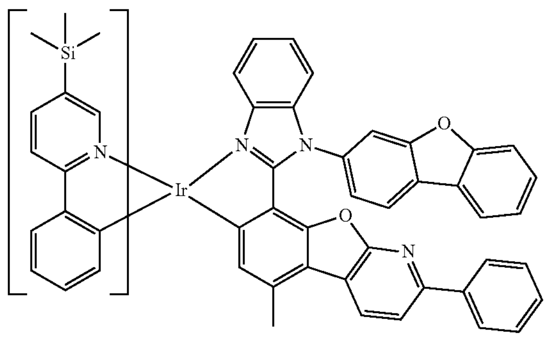
2787
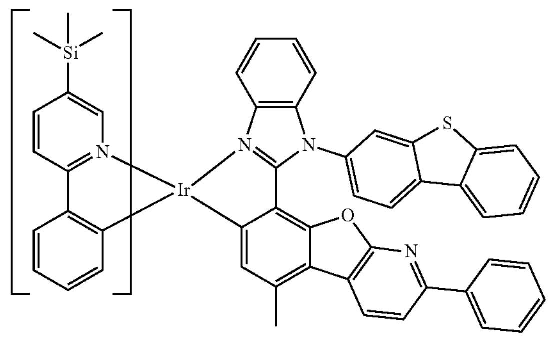
2788
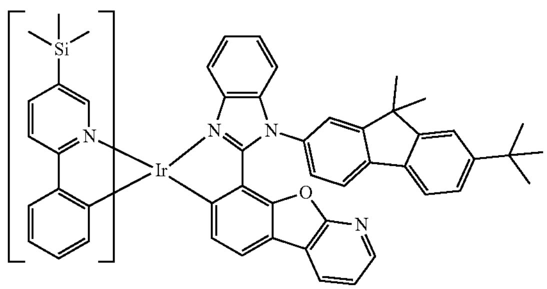
2789
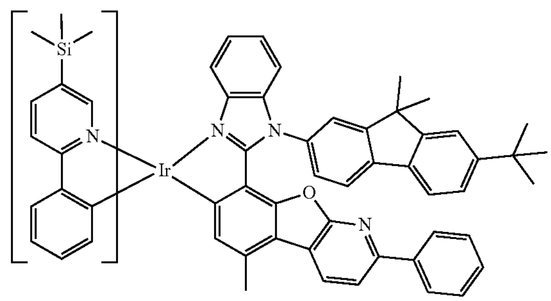
2790
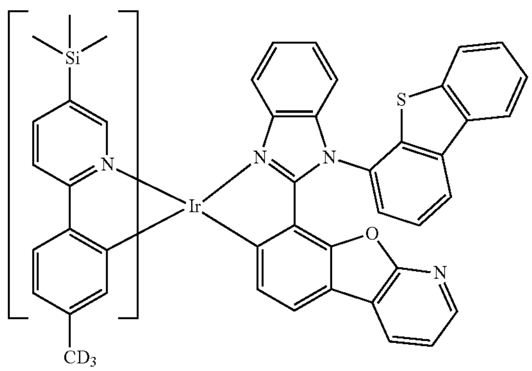
2791
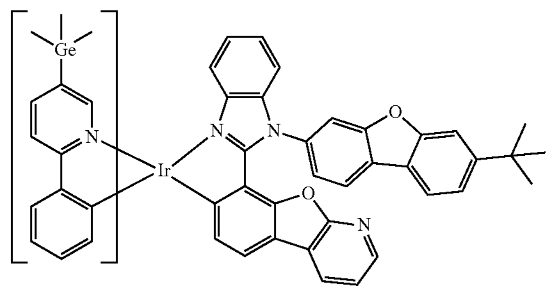
2792
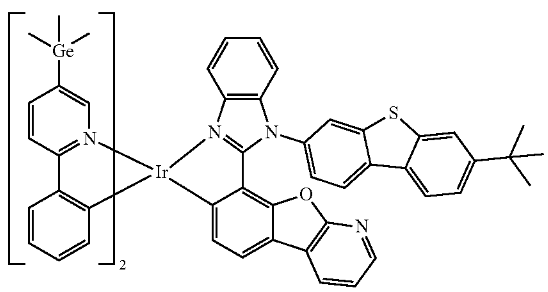
2793
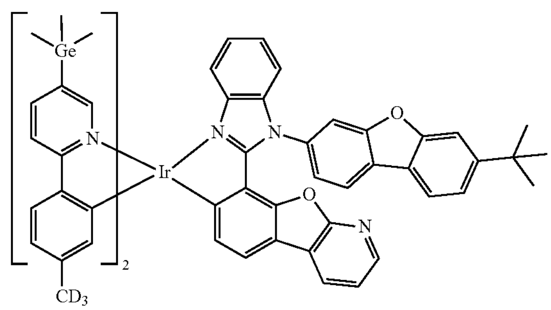

-continued
2794
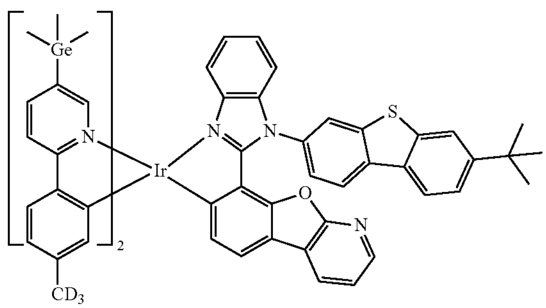
2795
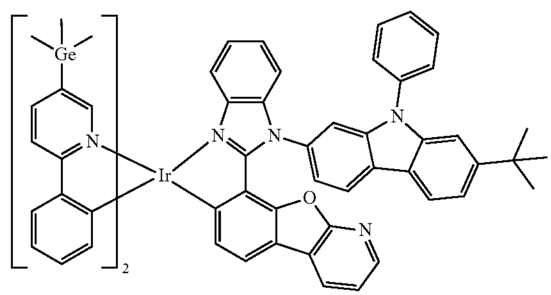
2796
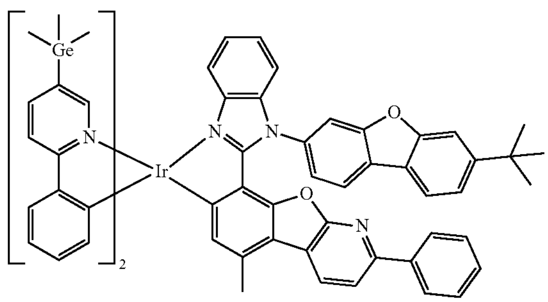
2797
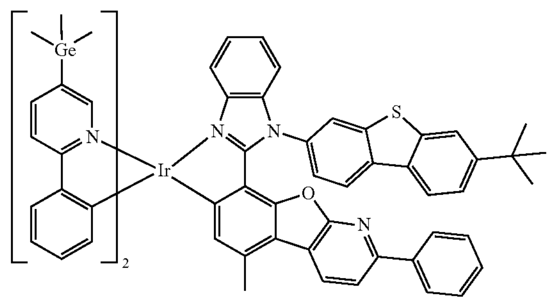
2798
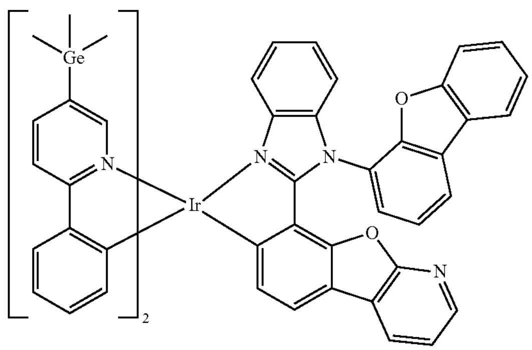
2799
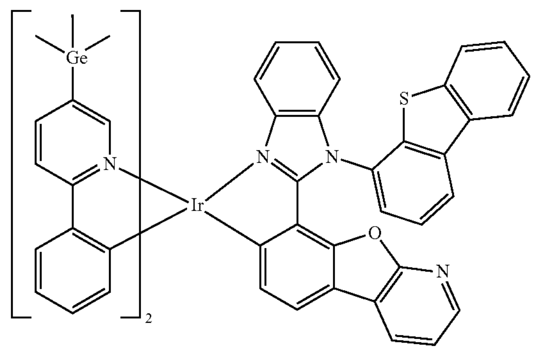
2800
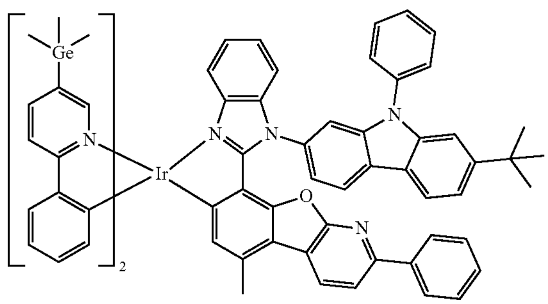
2801
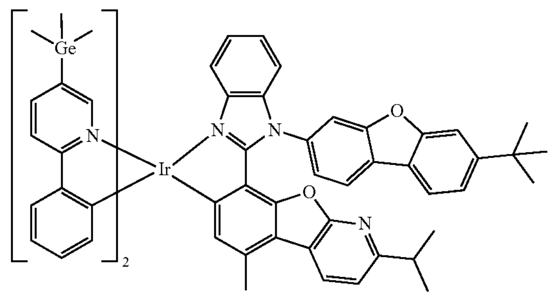

-continued
2802
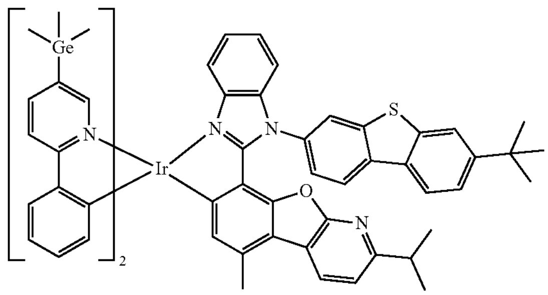
2803
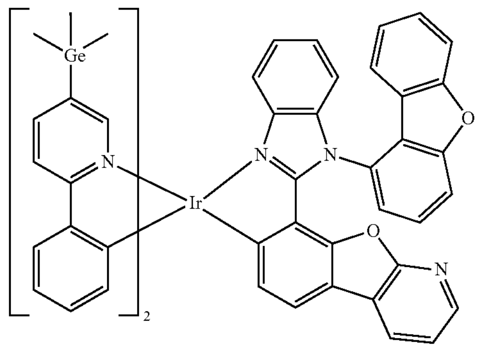
2804
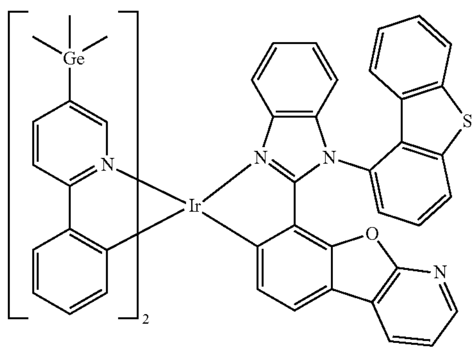
2805
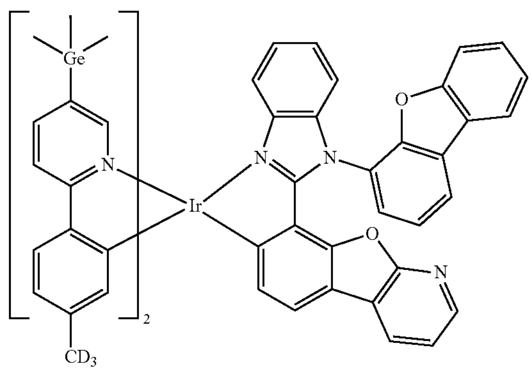
2806
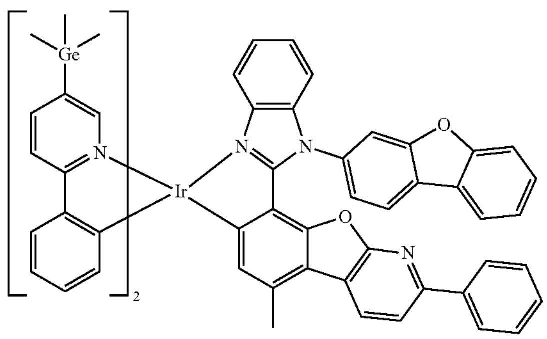
2807
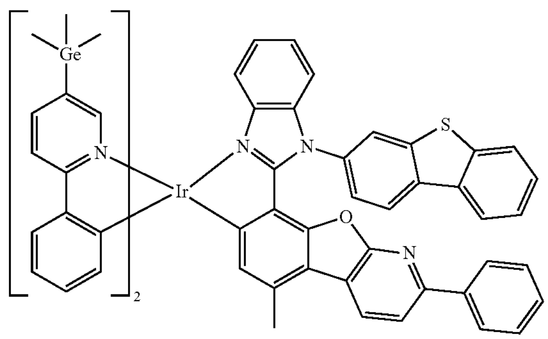
2808
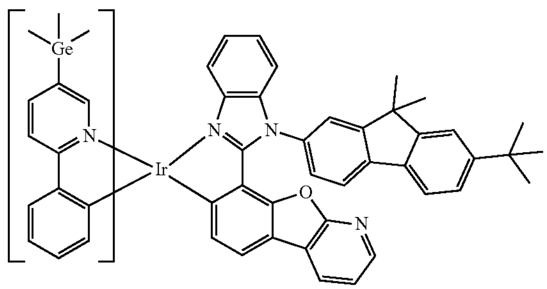
2809
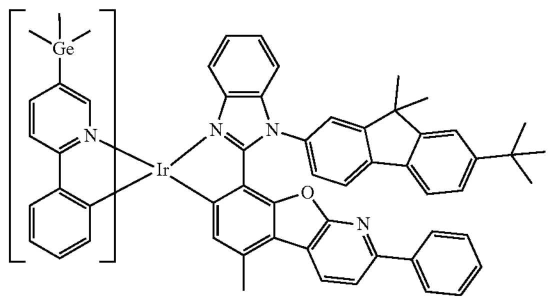

-continued
2810
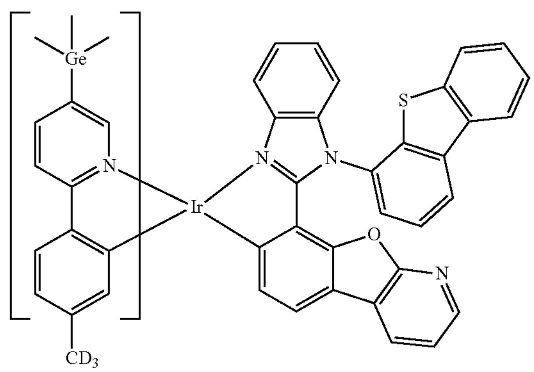
2811
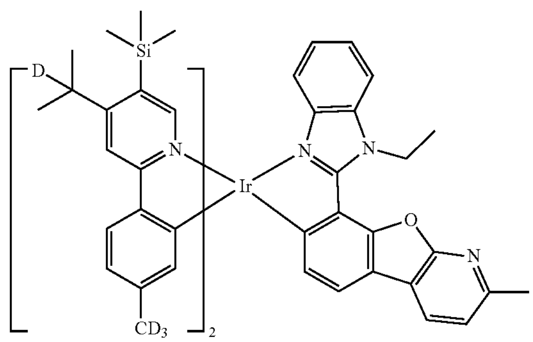
2812
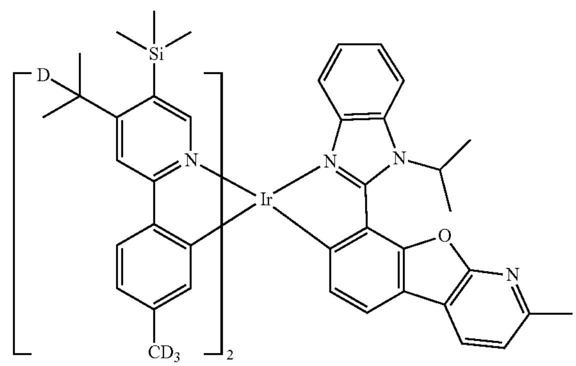
2813
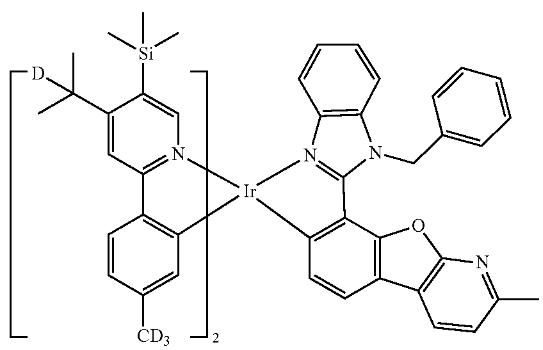
2814
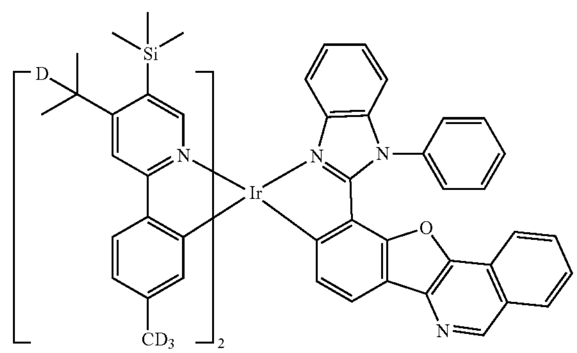
2815
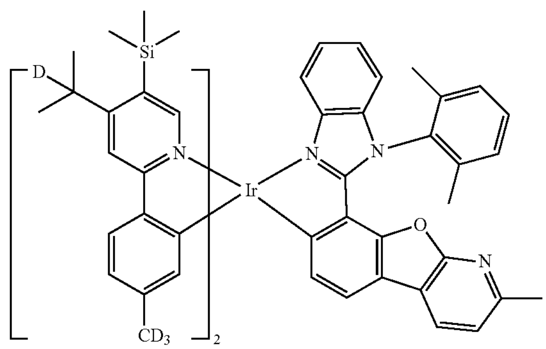
2816
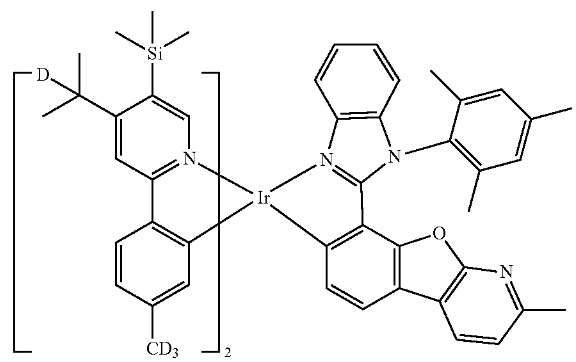

-continued
2817
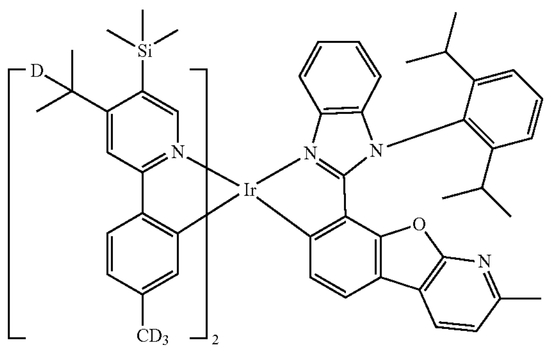
2818
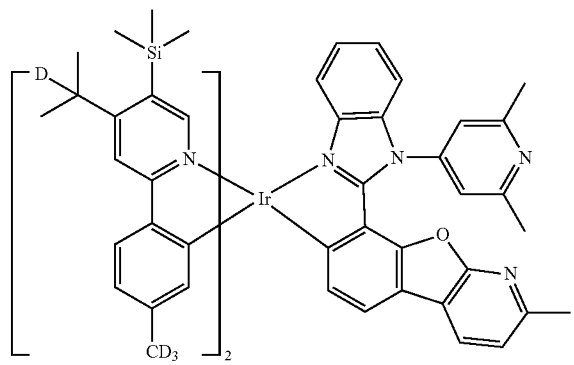
2819
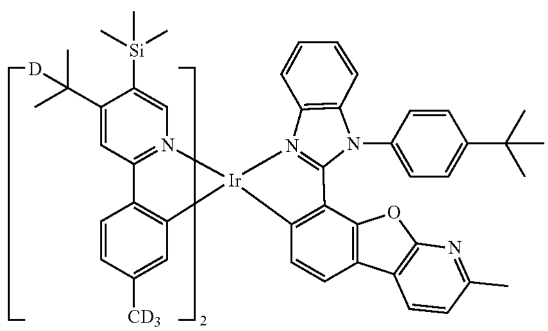
2820
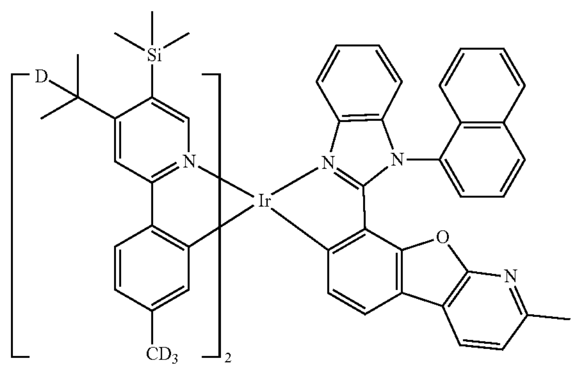
2821
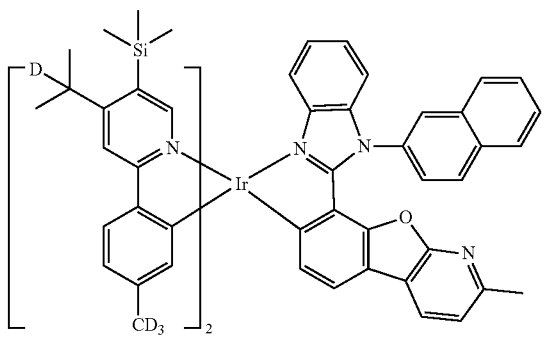
2822
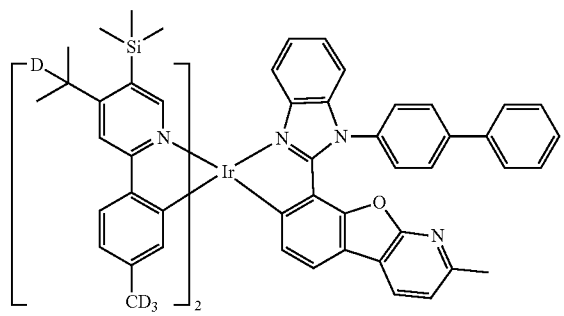
2823
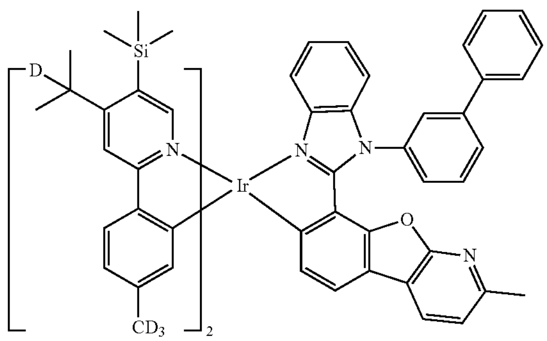
2824
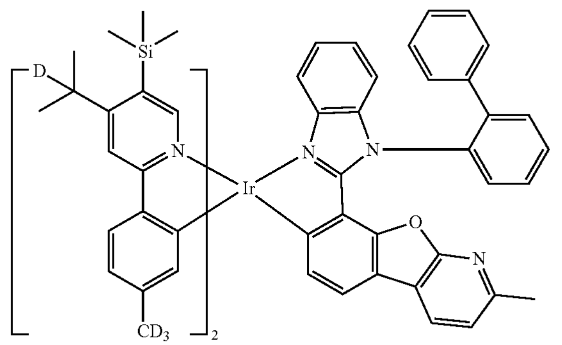

-continued
2825
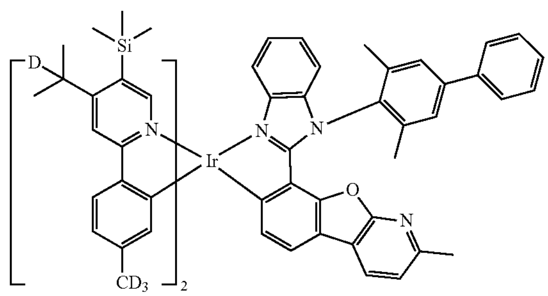
2826
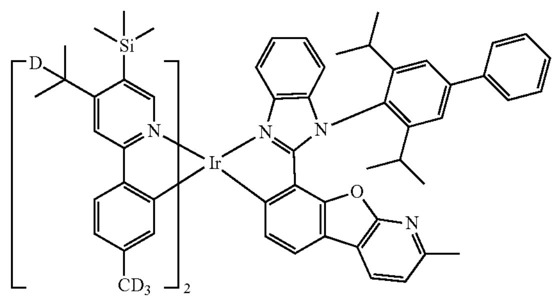
2827
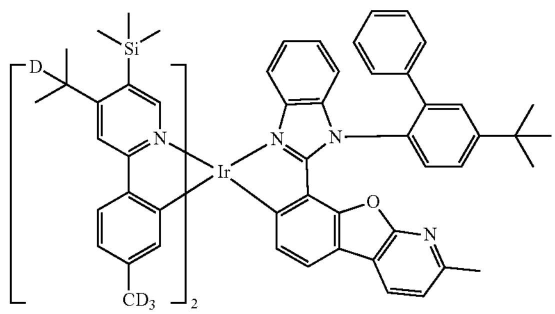
2828
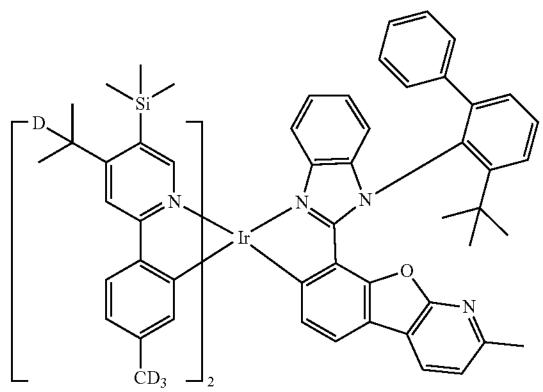
2829
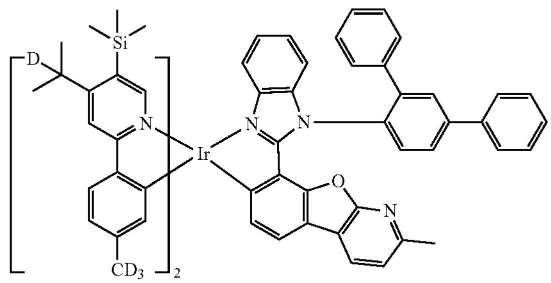
2830
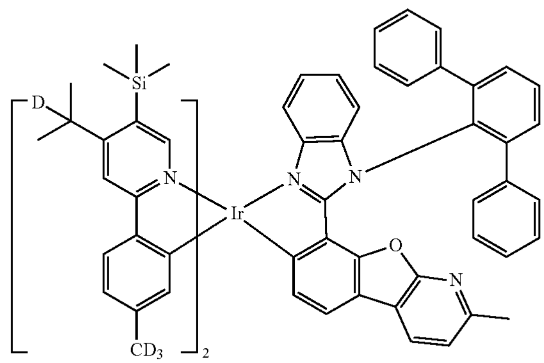
2831
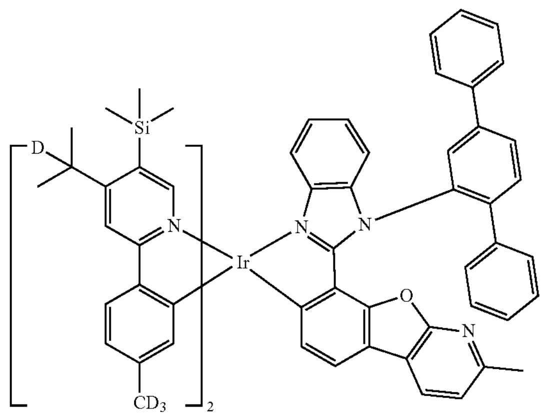
2832
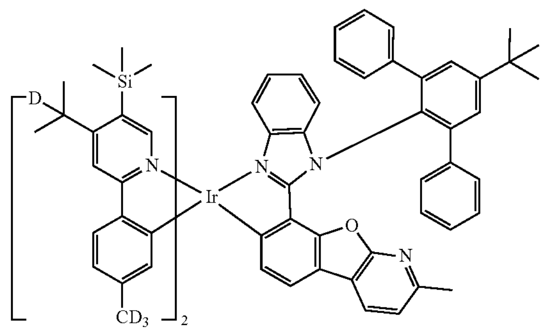

-continued
2833
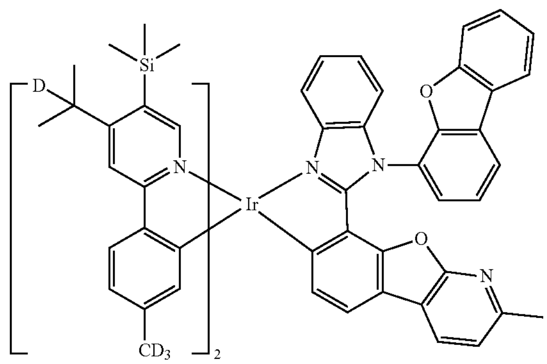
2834
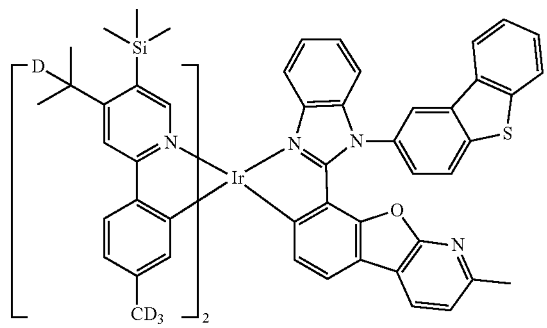
2835
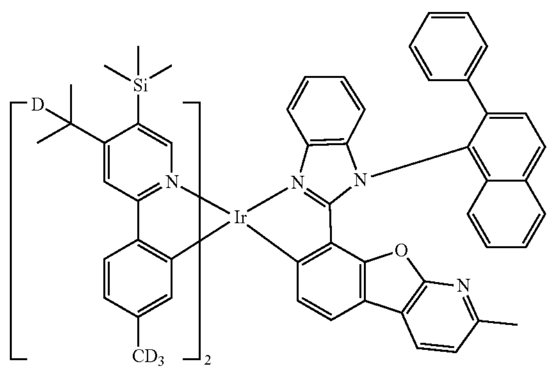
2836
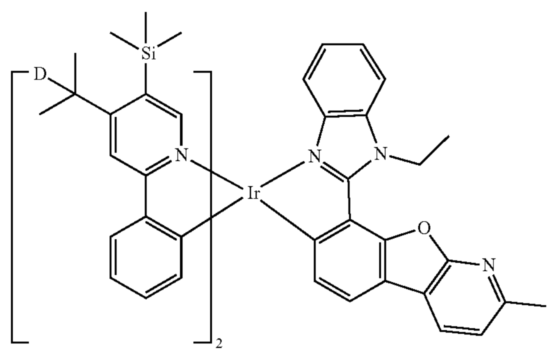
2837
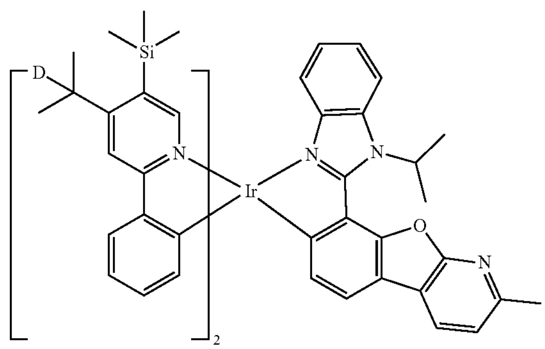
2838
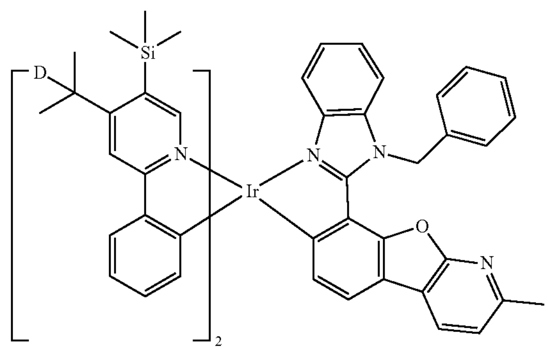
2839
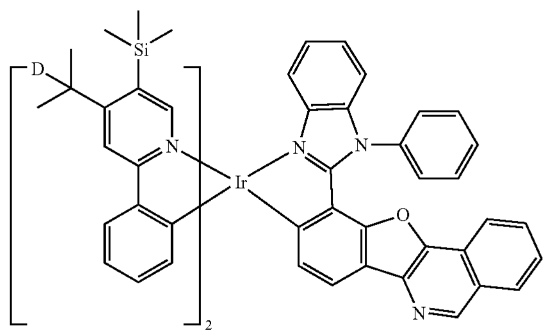
2840
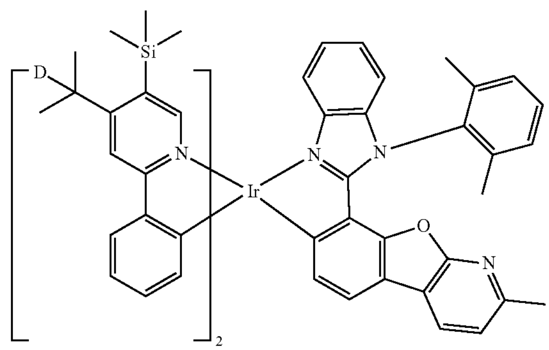

-continued
2841
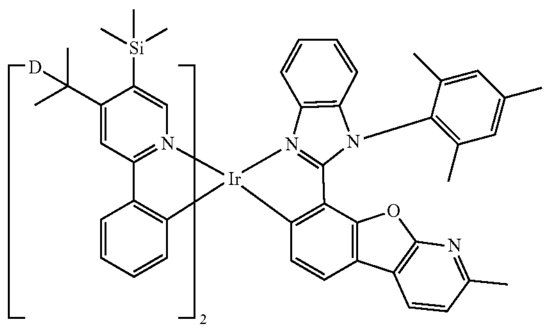
2842
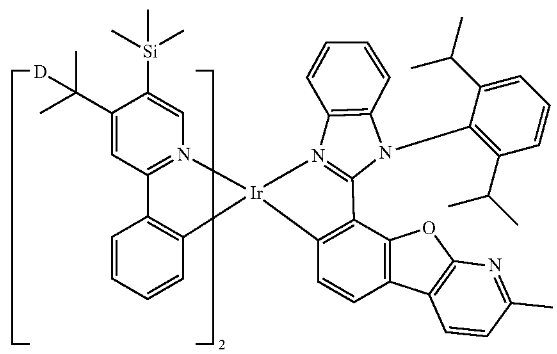
2843
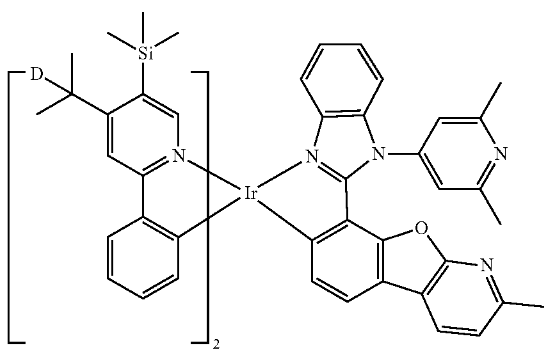
2844
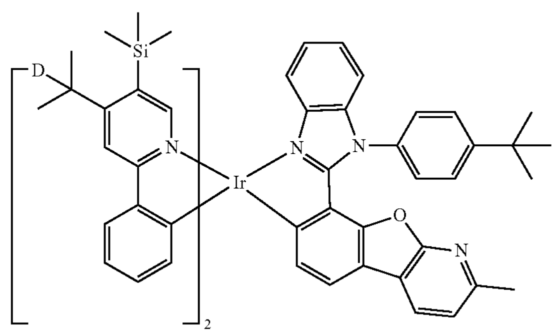
2845
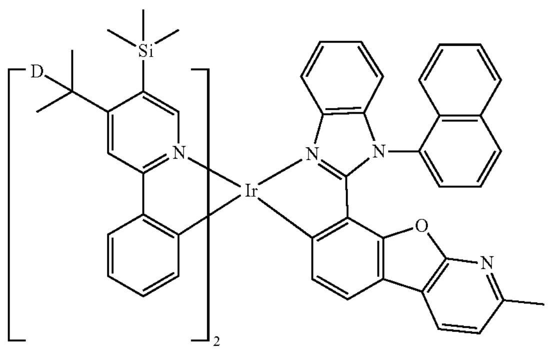
2846
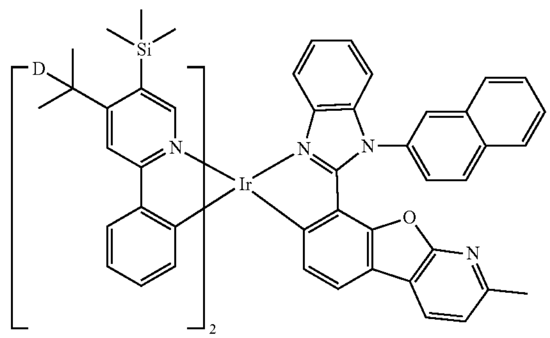
2847
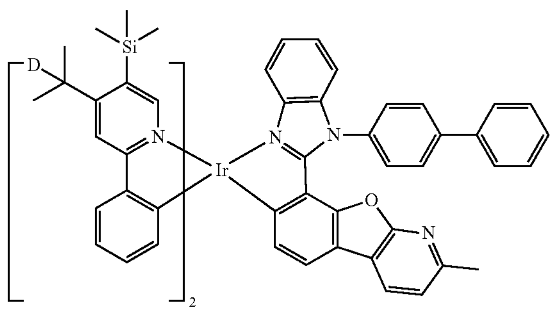
2848
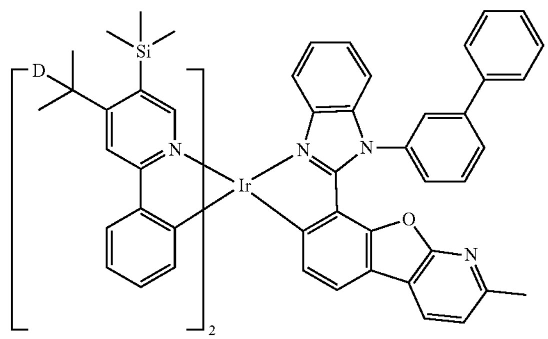

-continued
2849
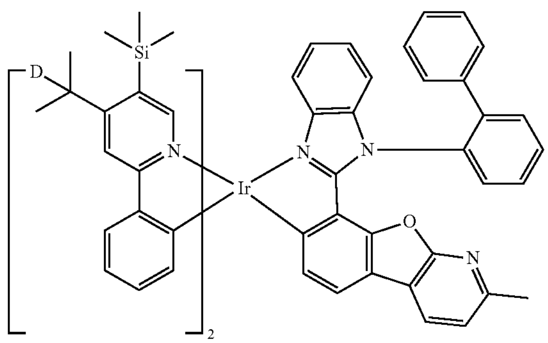
2850
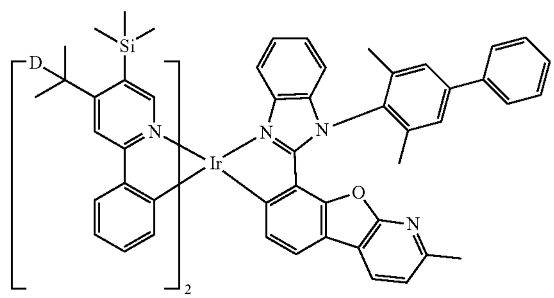
2851
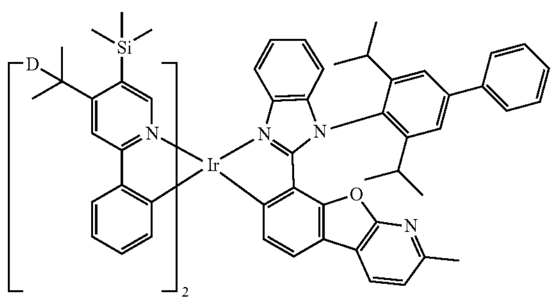
2852
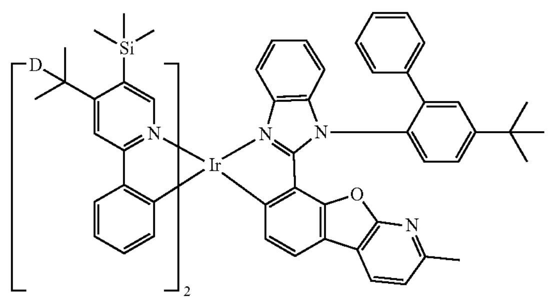
2853
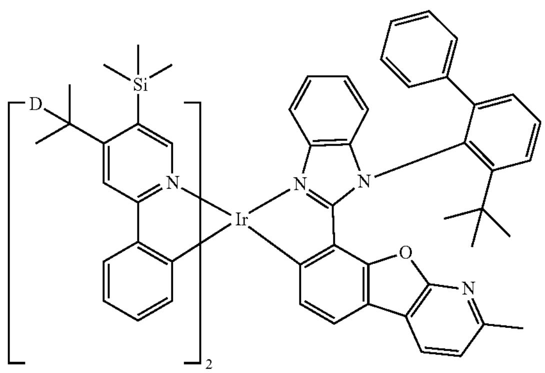
2854
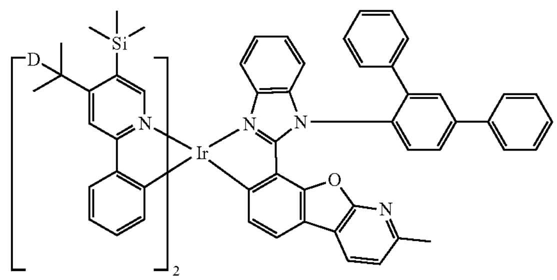
2855
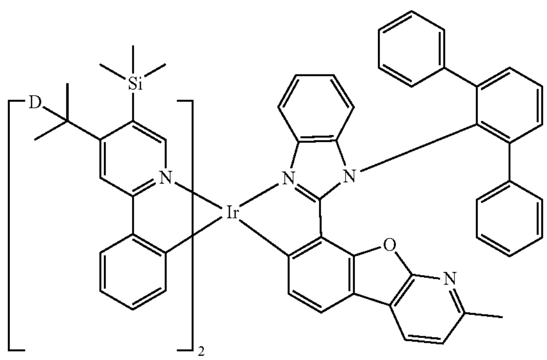
2856
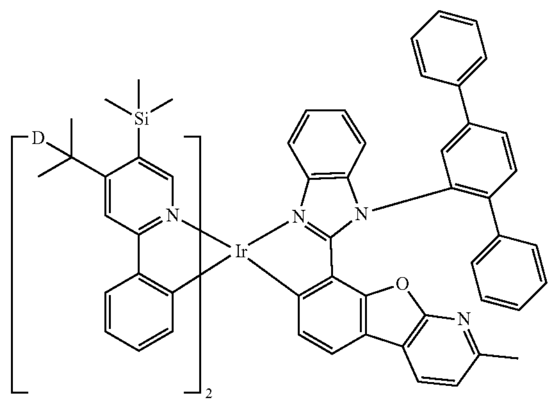

-continued
2857
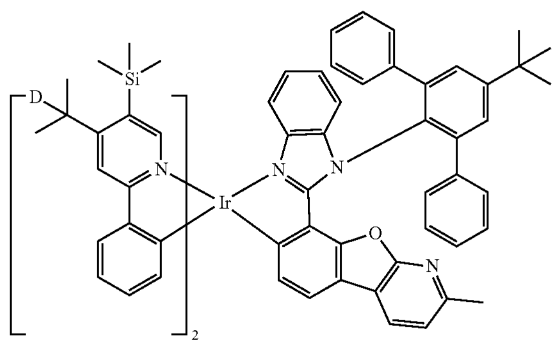
2858
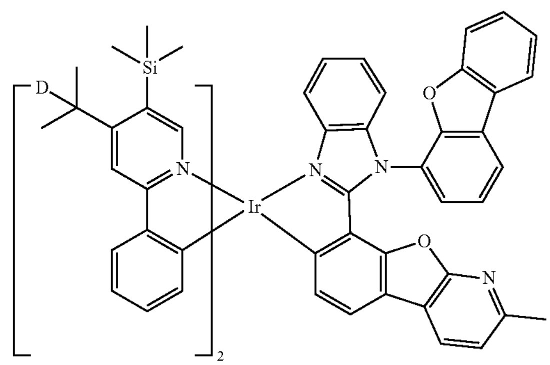
2859
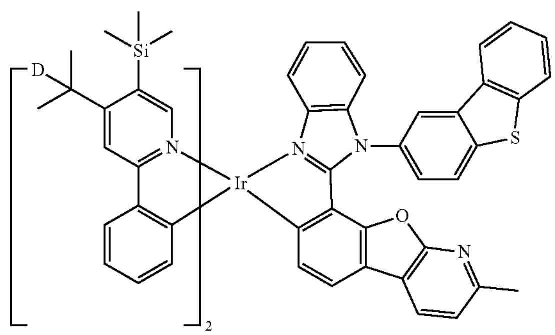
2860
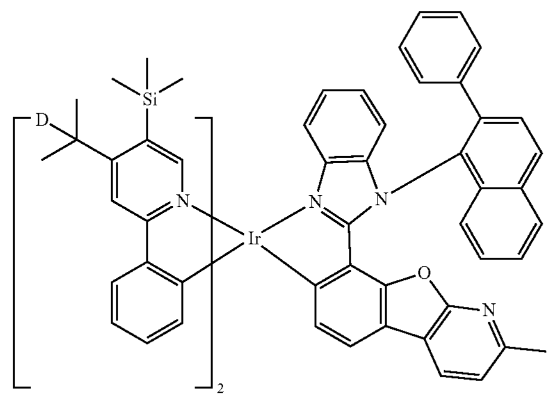
2861
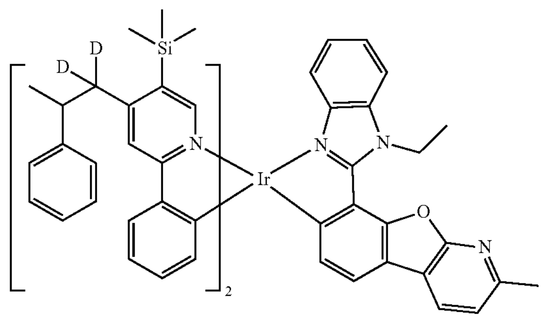
2862
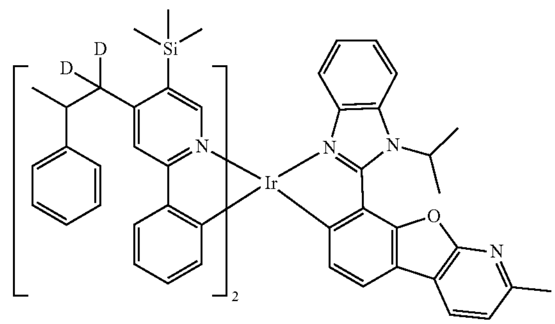
2863
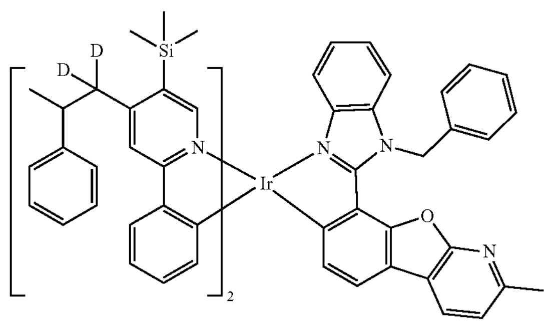
2864
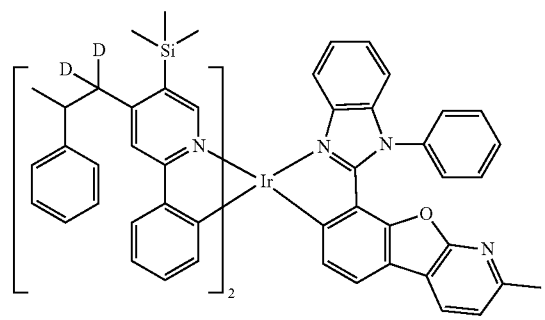

-continued
2865
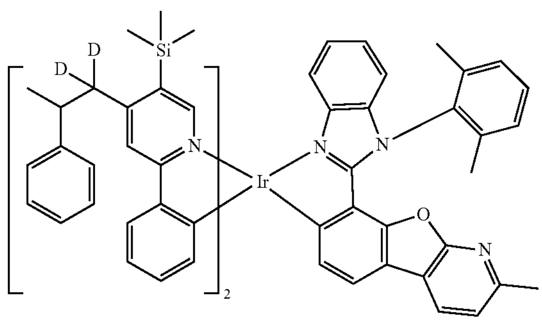
2866
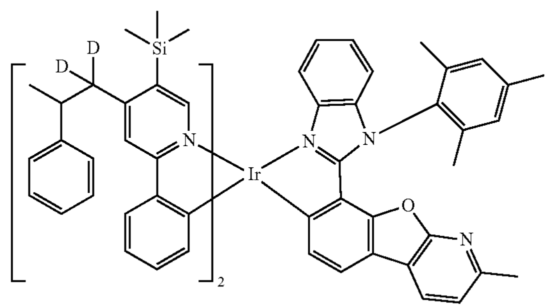
2867
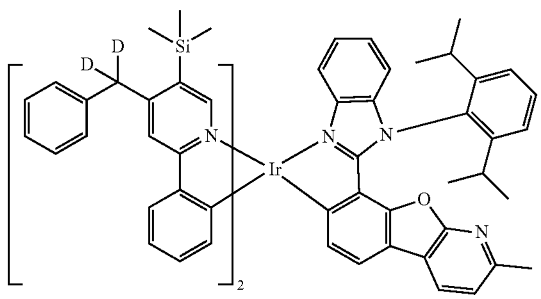
2868
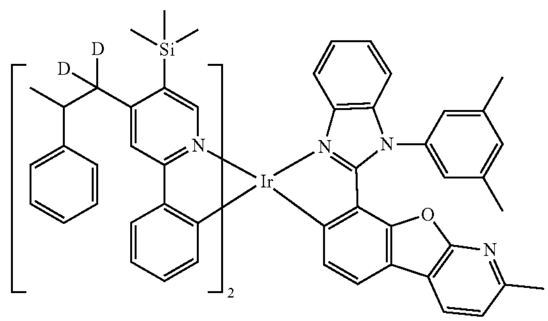
2869
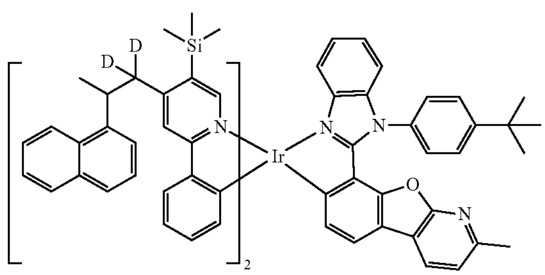
2870
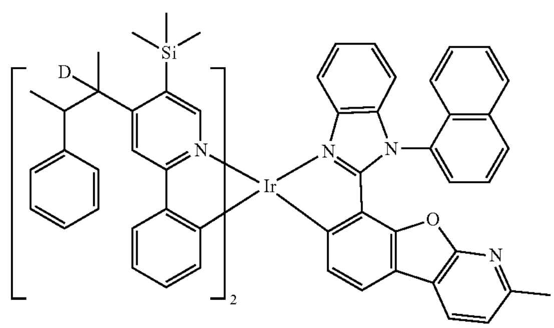
2871
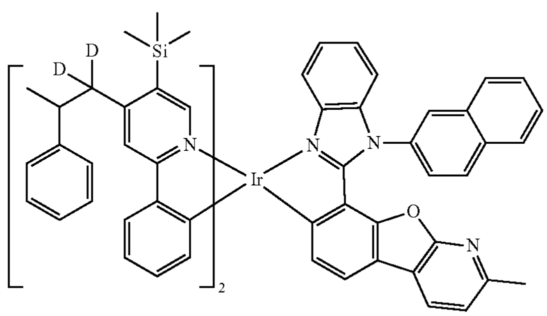
2872
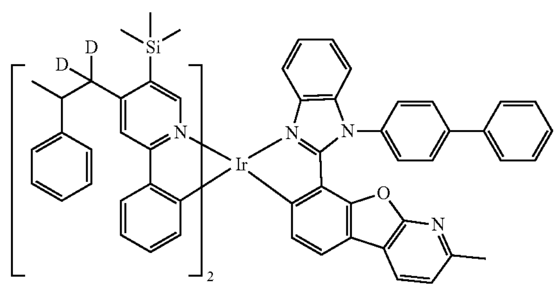

-continued
2873
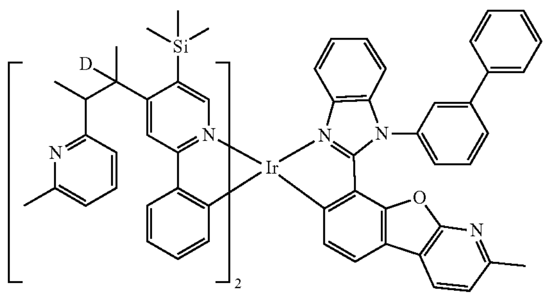
2874
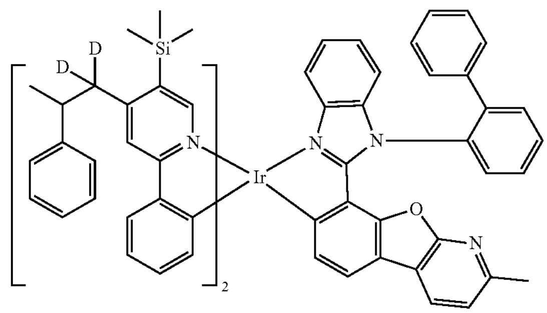
2875
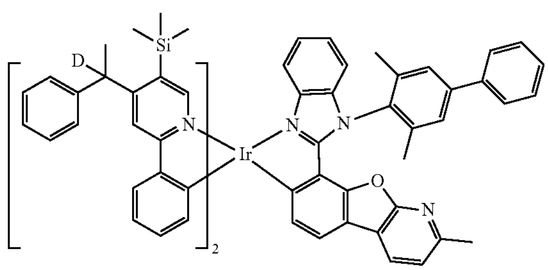
2876
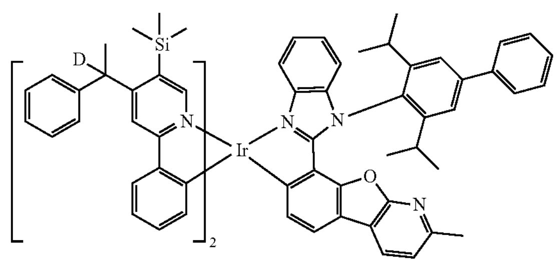
2877
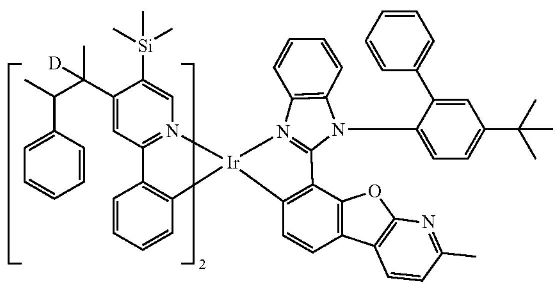
2878
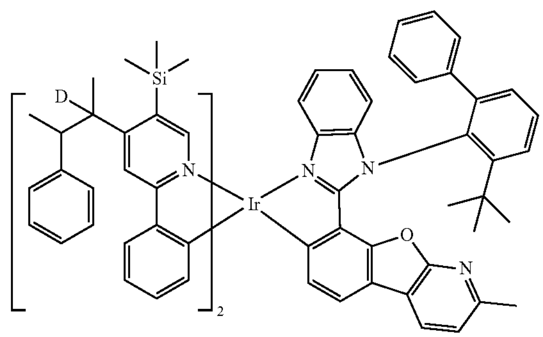
2879
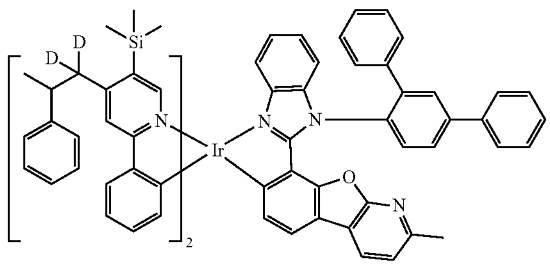
2880
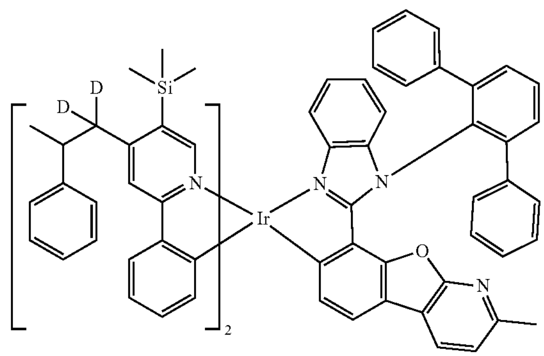

-continued
2881
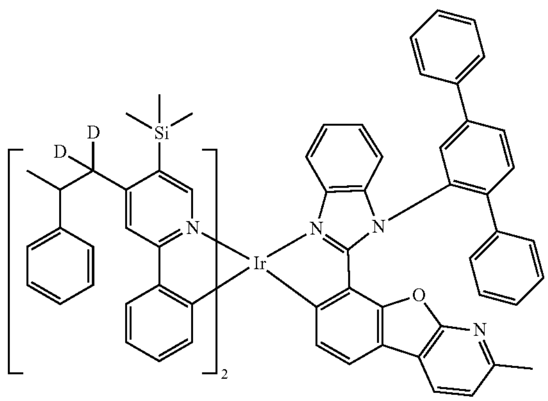
2882
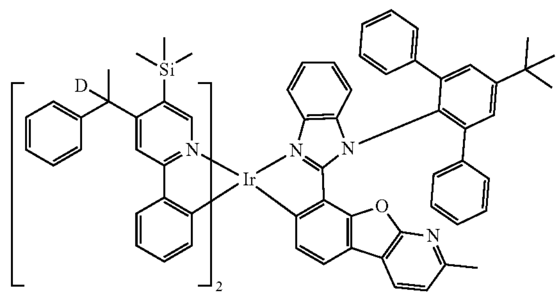
2883
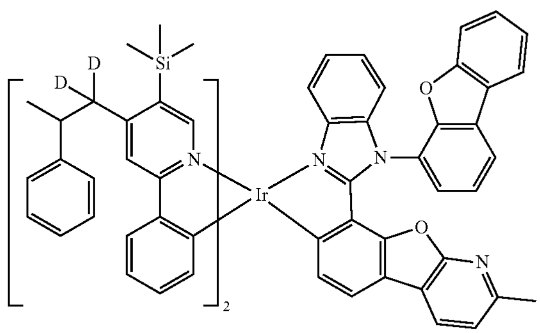
2884
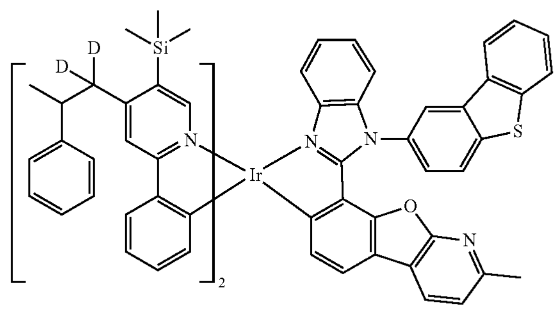
2885
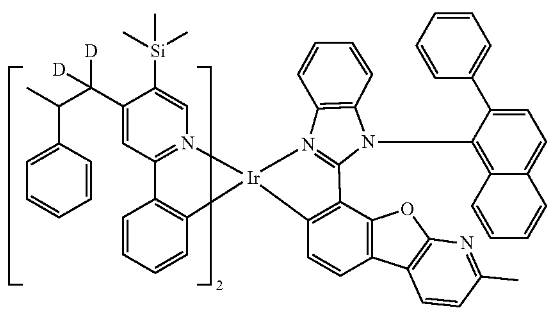
2886
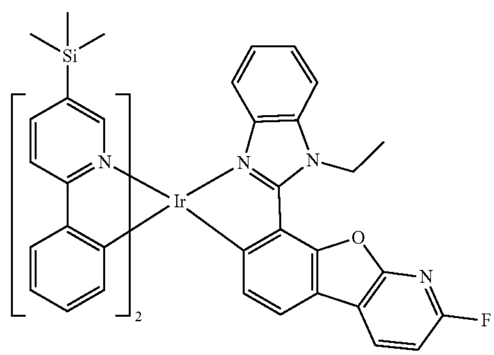
2887
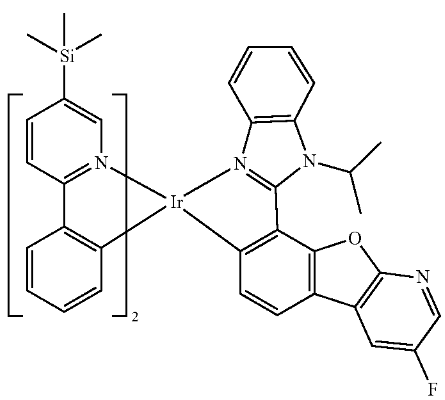
2888
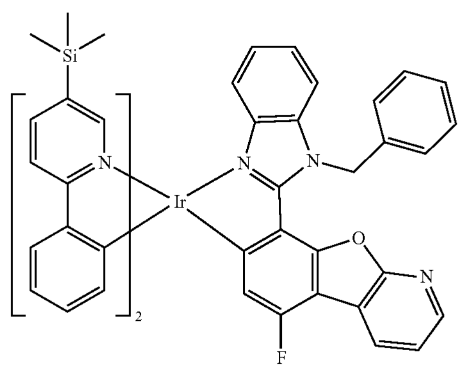

-continued
2889
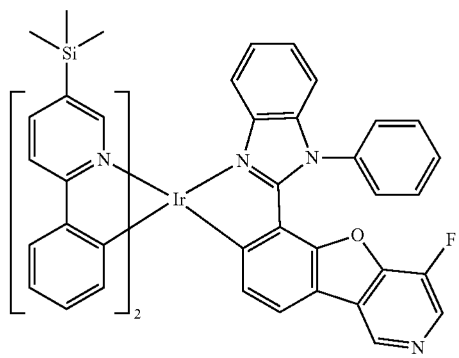
2890
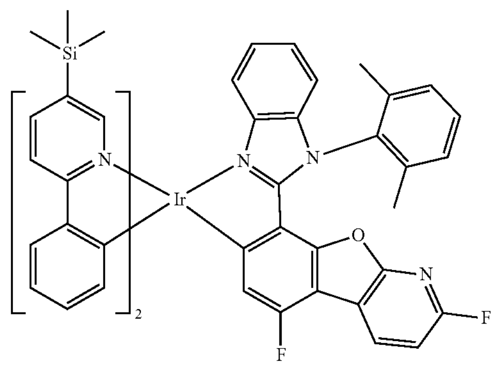
2891
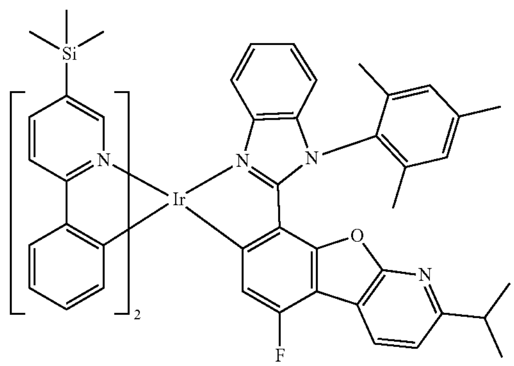
2892
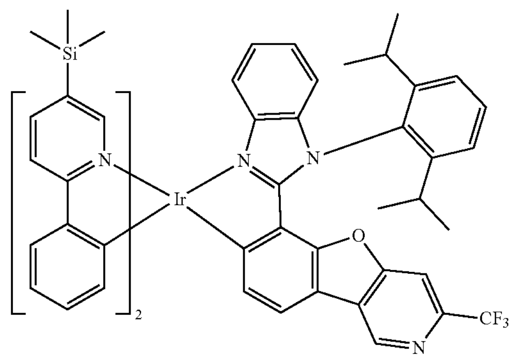
2893
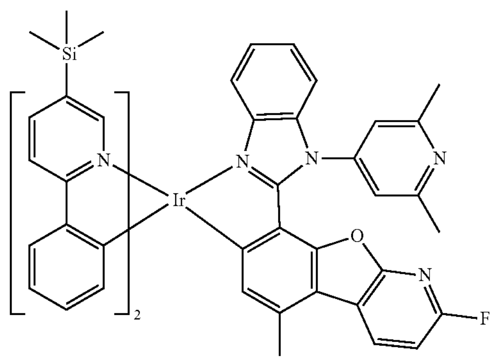
2894
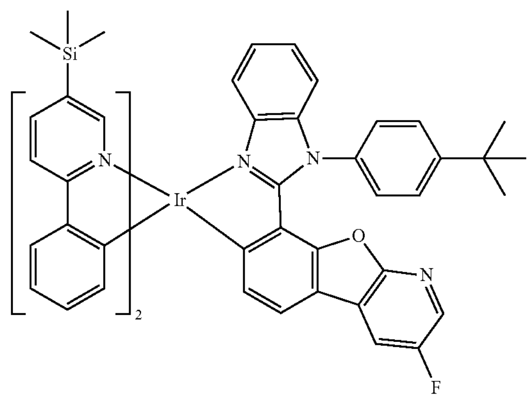
2895
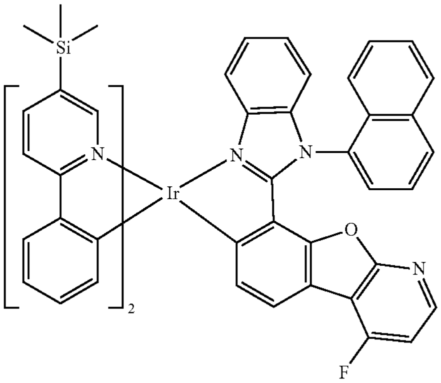
2896
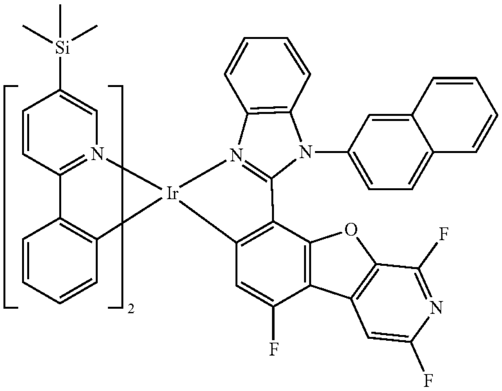

-continued
2897
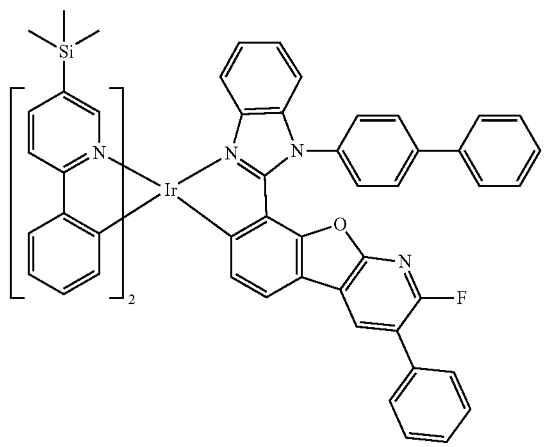
2898
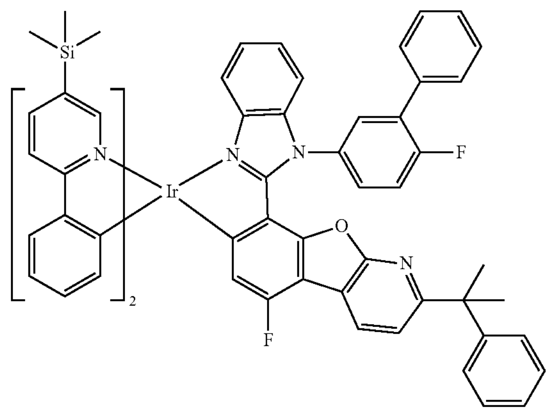
2899
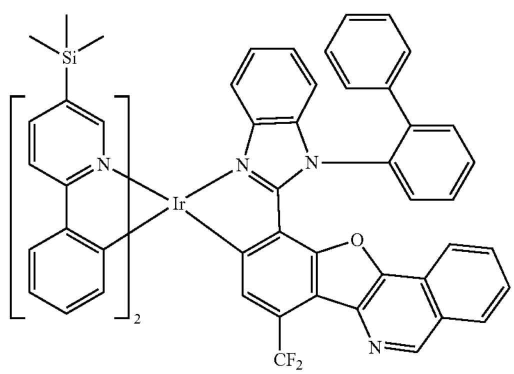
2900
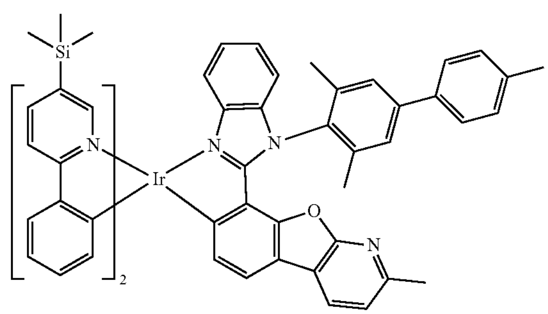
2901
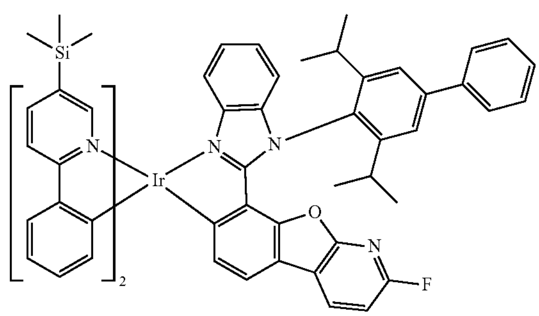
2902
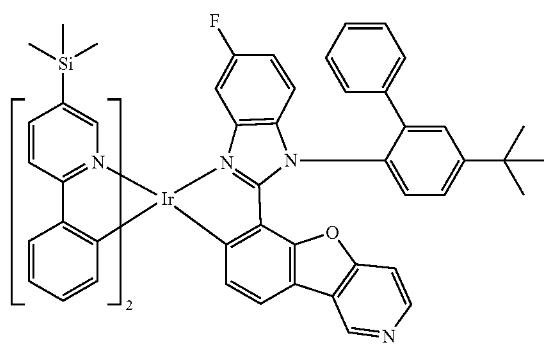
2903
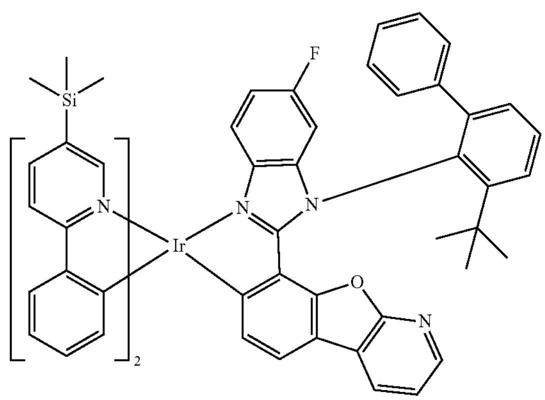
2904
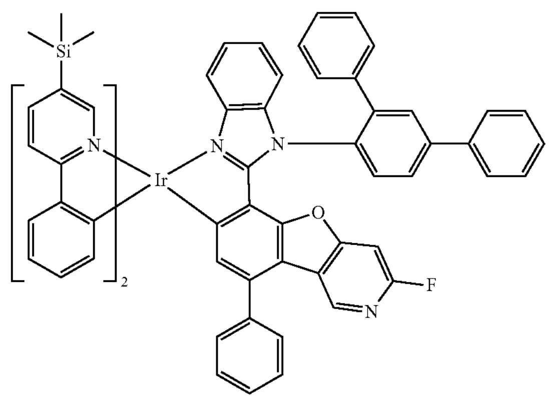

-continued
2905
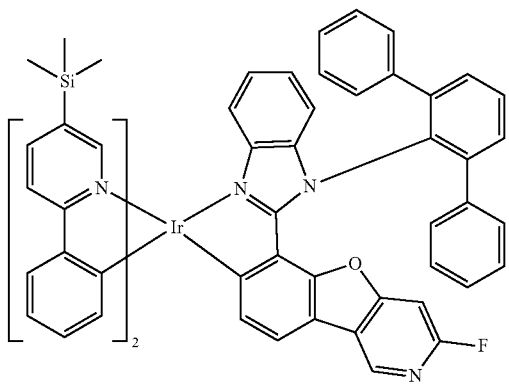
2906
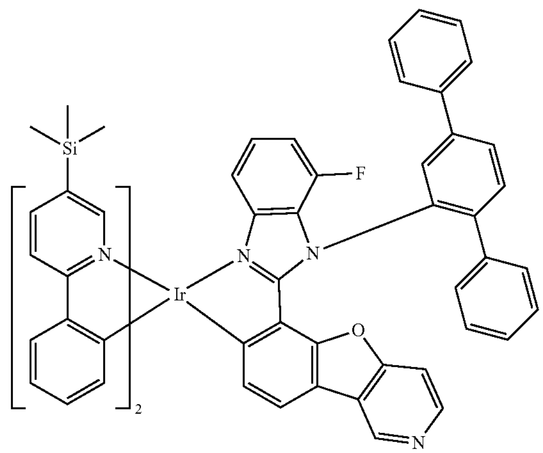
2907
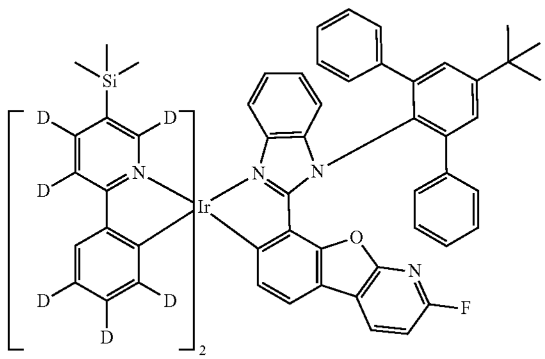
2908
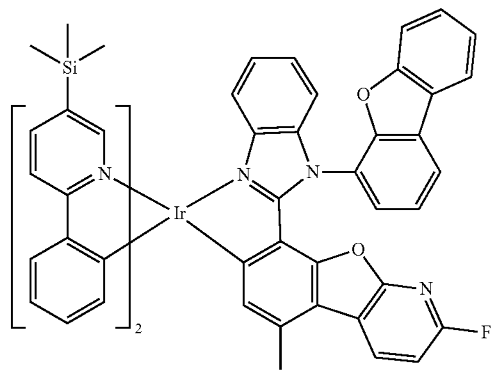
2909
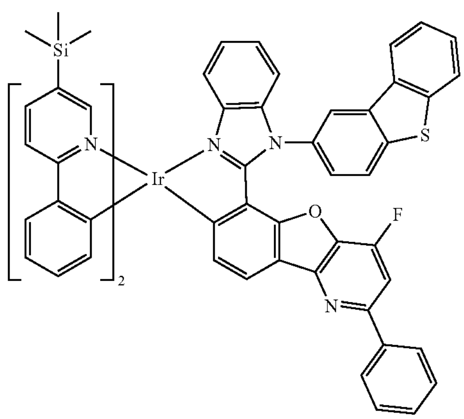
2910
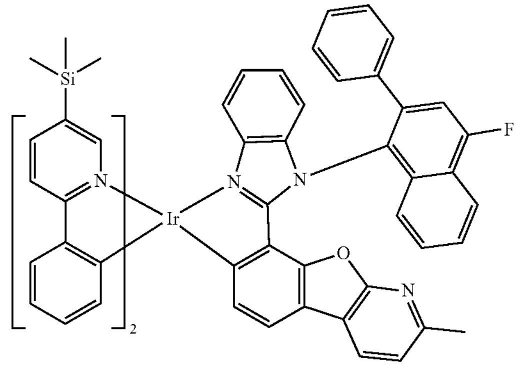

-continued
2911
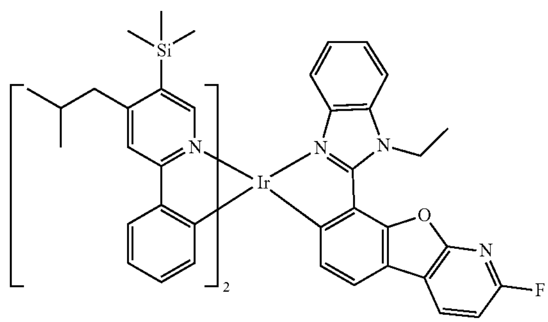
2912
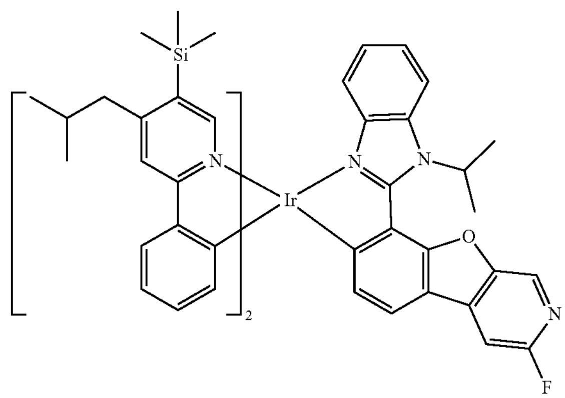
2913
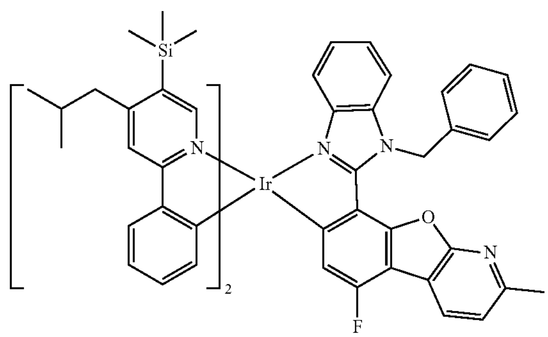
2914
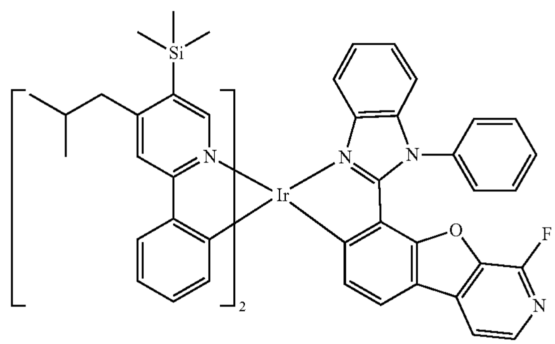
2915
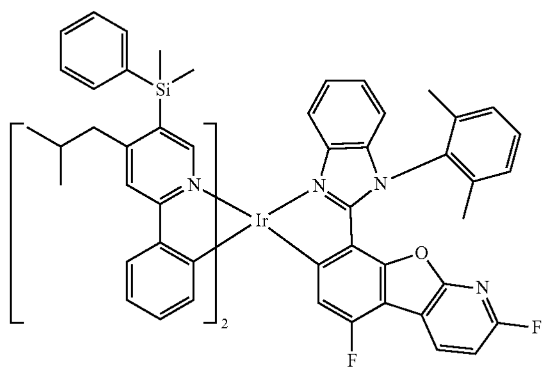
2916
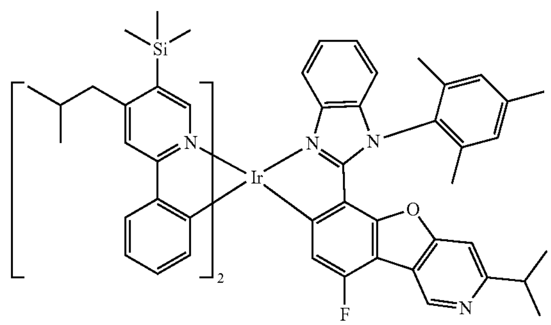
2917
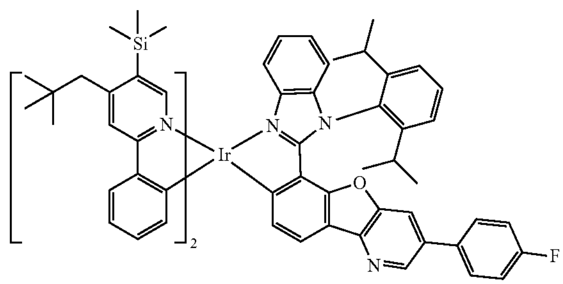
2918
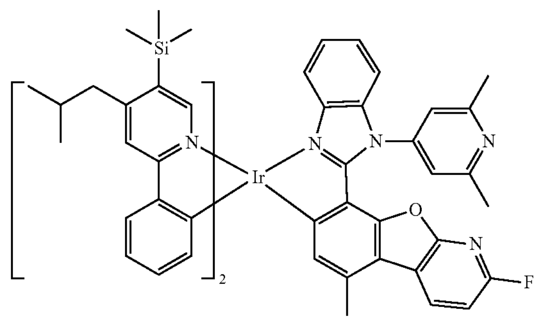

-continued
2919
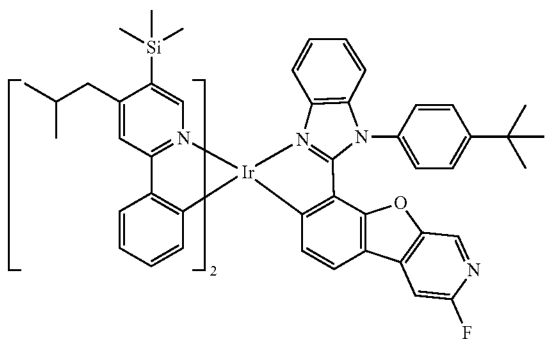
2920
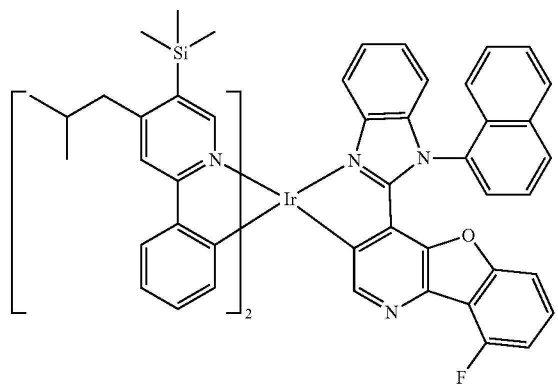
2921
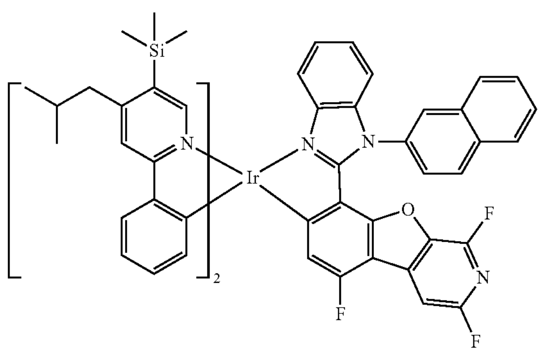
2922
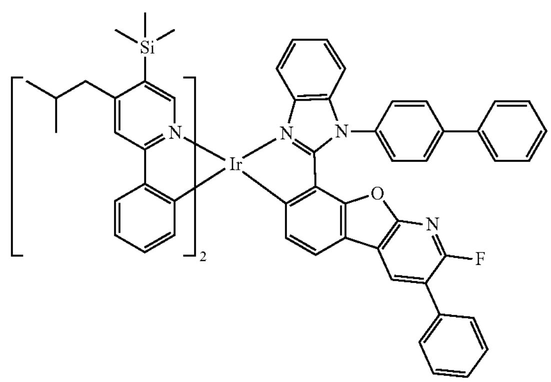
2923
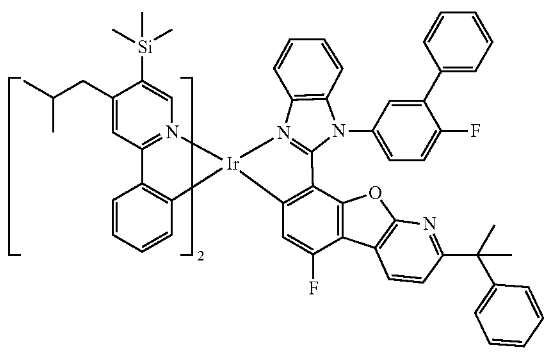
2924
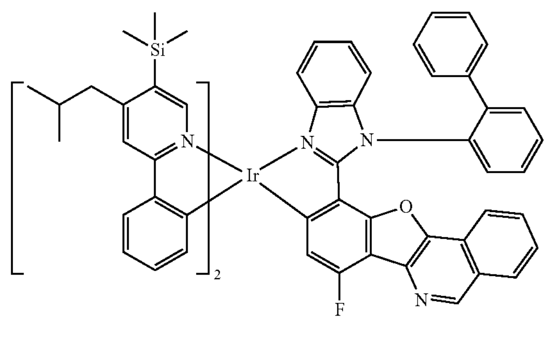
2925
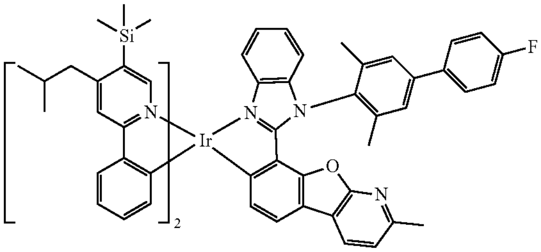
2926
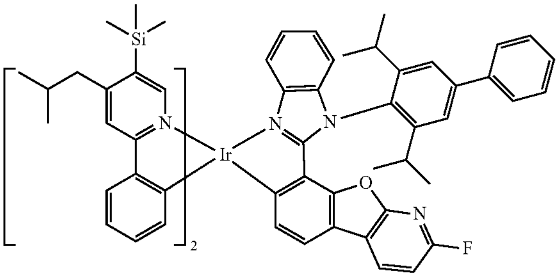

-continued
2927
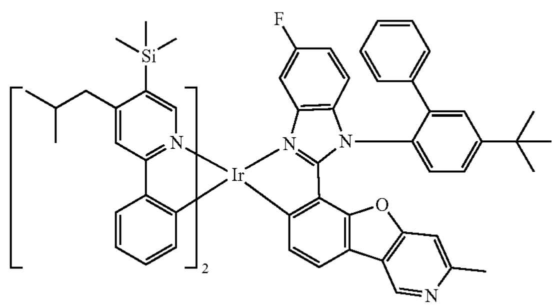
2928
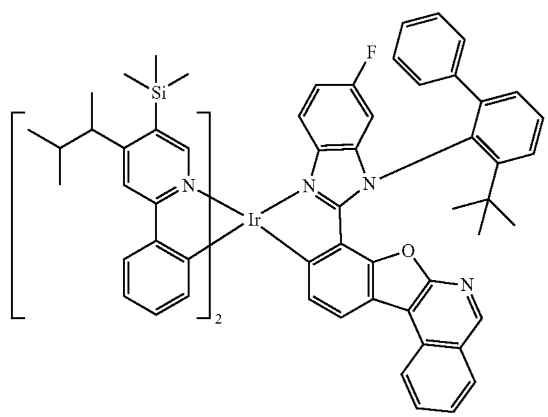
2929
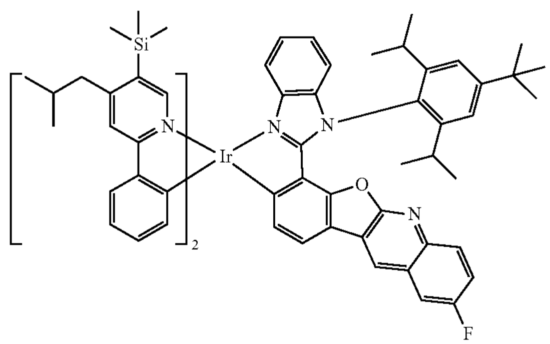
2930
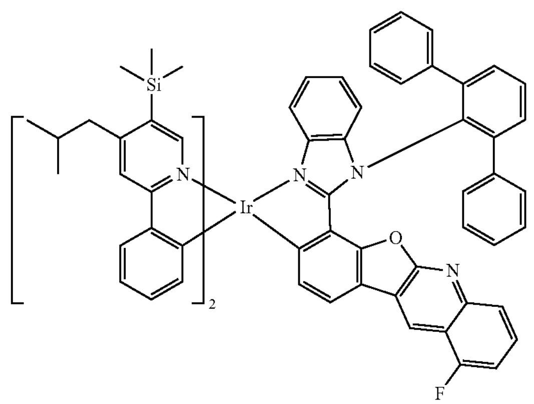
2931
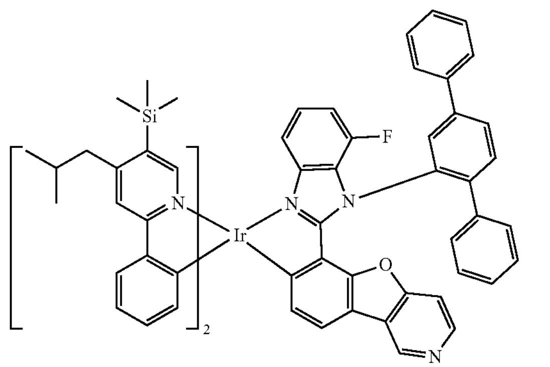
2932
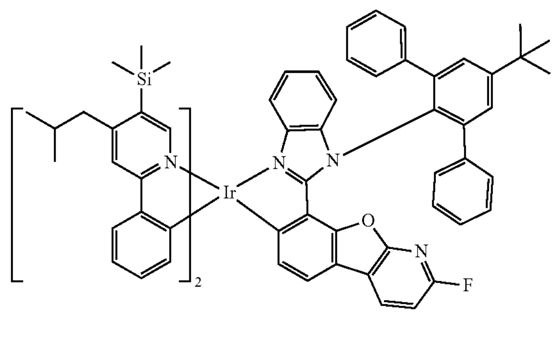

-continued
2933
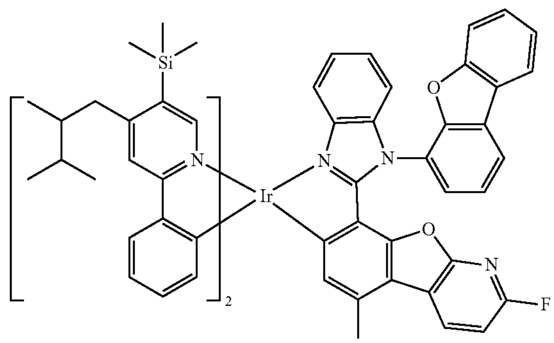
2934
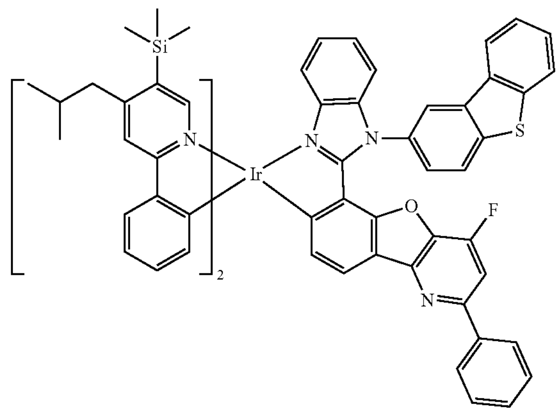
2935
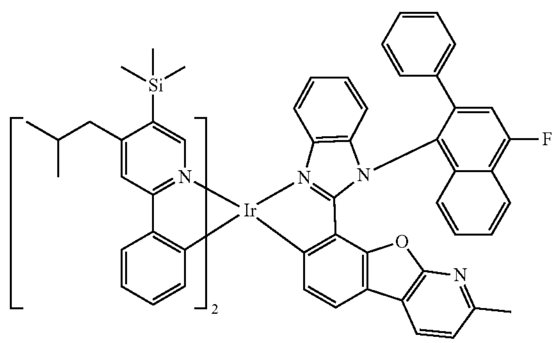
2936
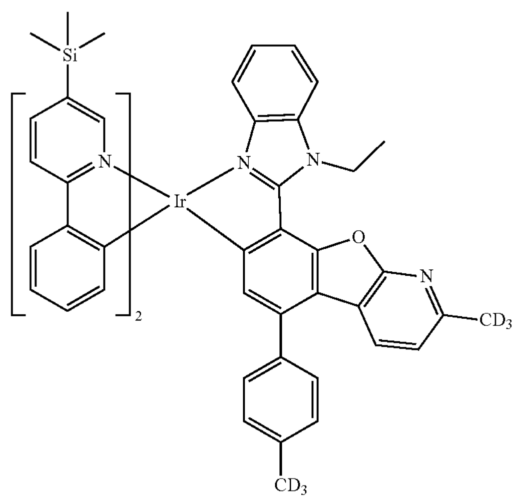
2937
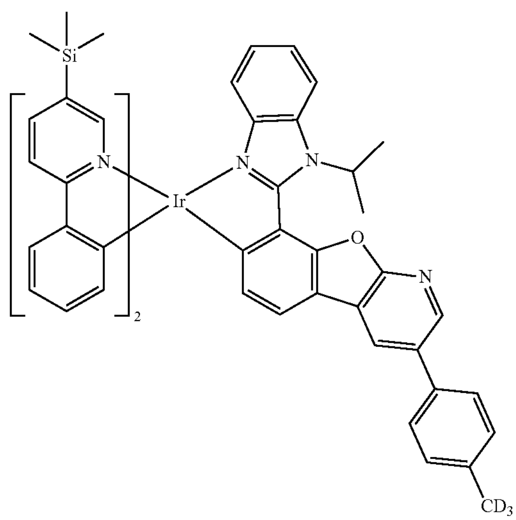
2938
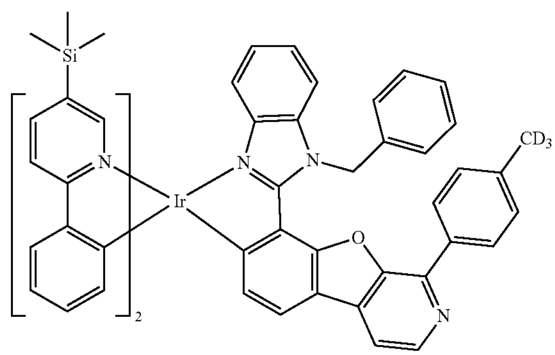

-continued
2939
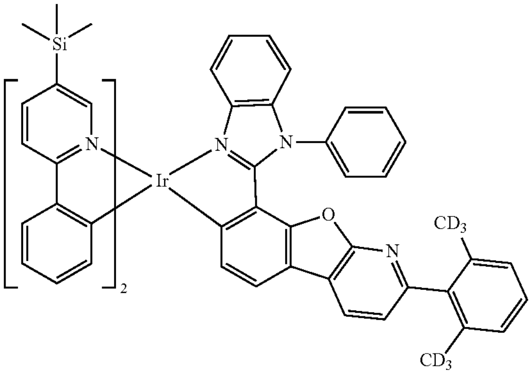
2940
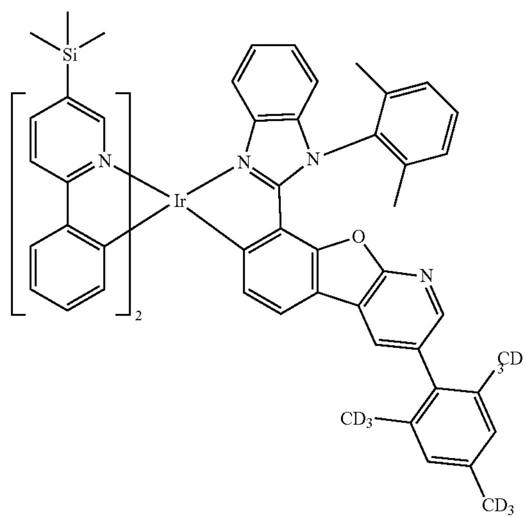
2941
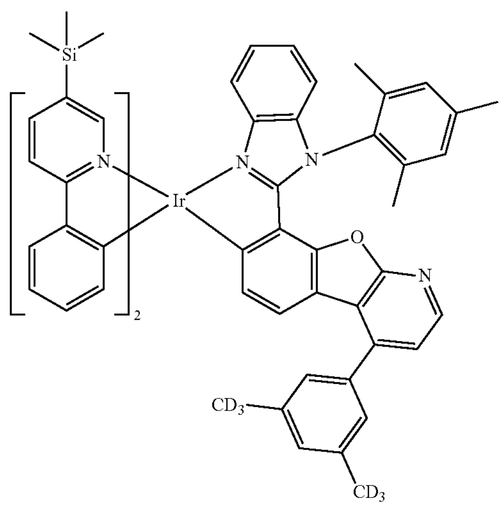
2942
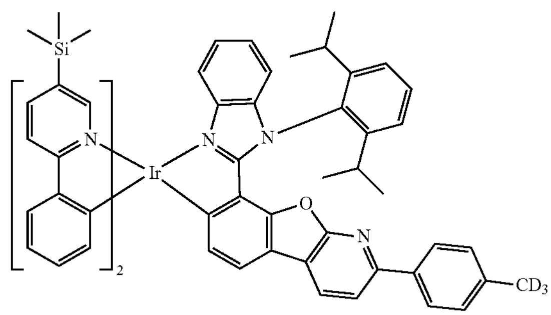
2943
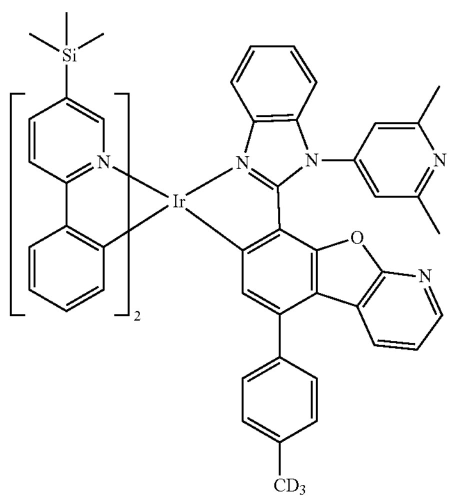
2944
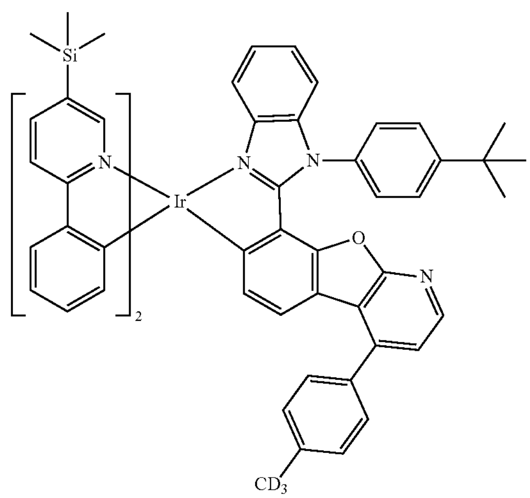

-continued
2945
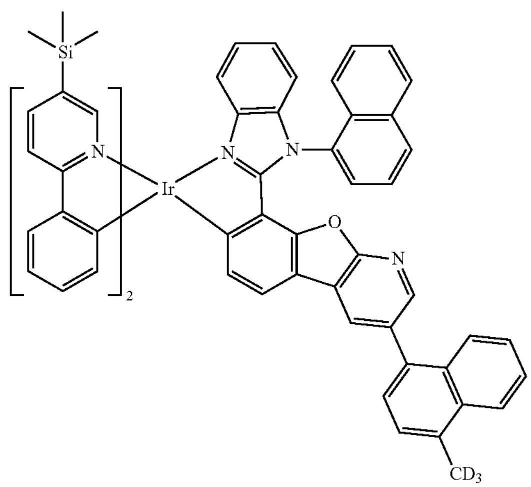
2946
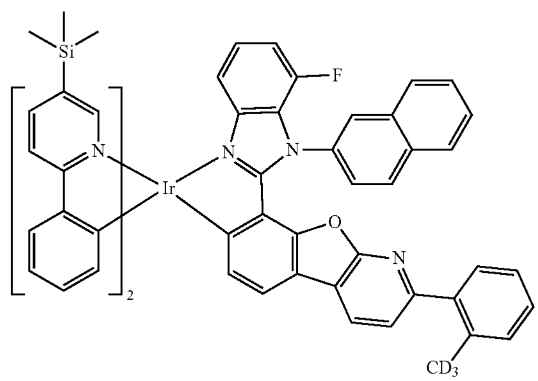
2947
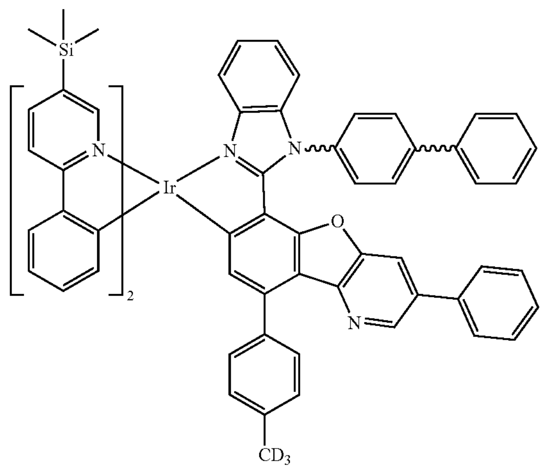
2948
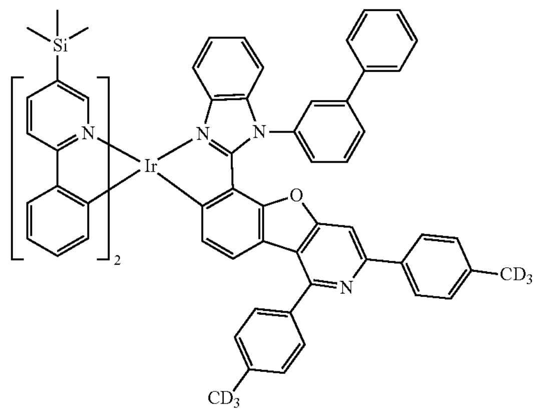
2949
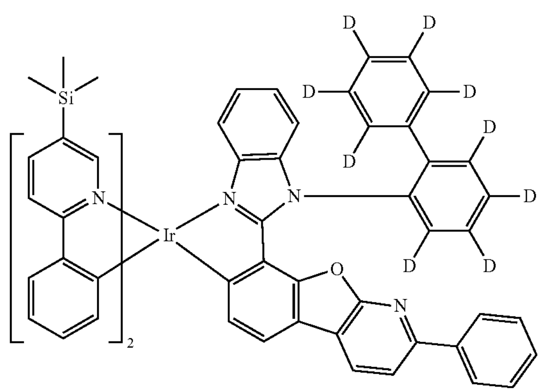
2950
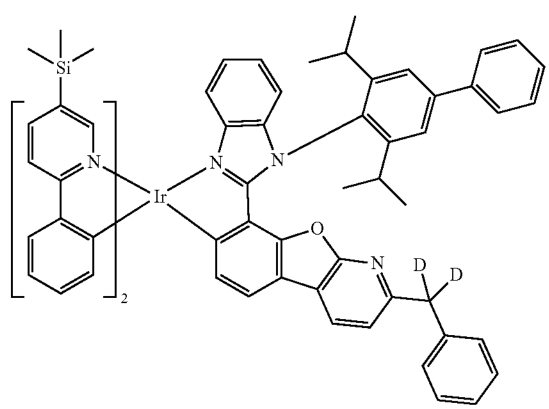

-continued
2951
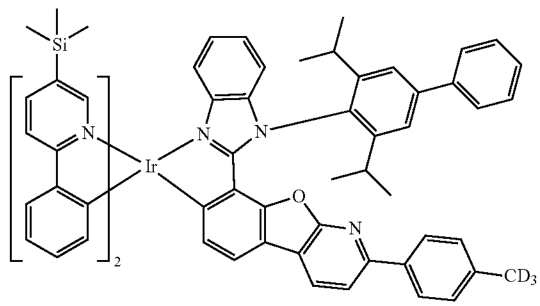
2952
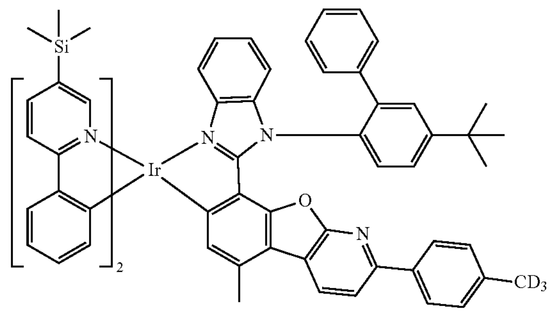
2953
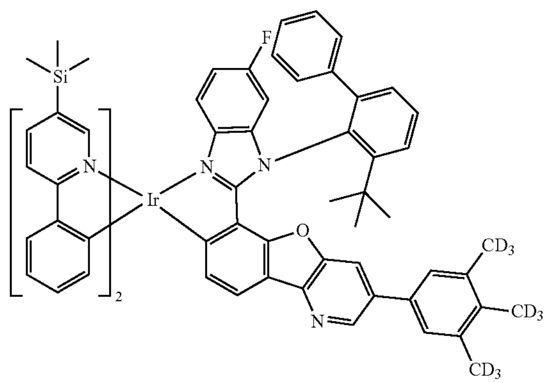
2954
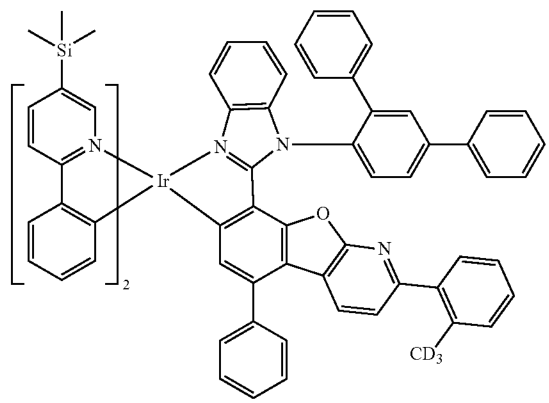
2955
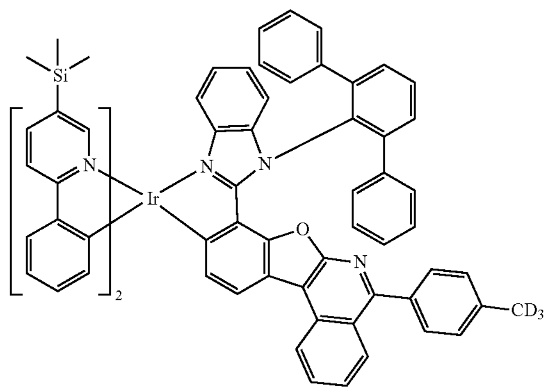
2956
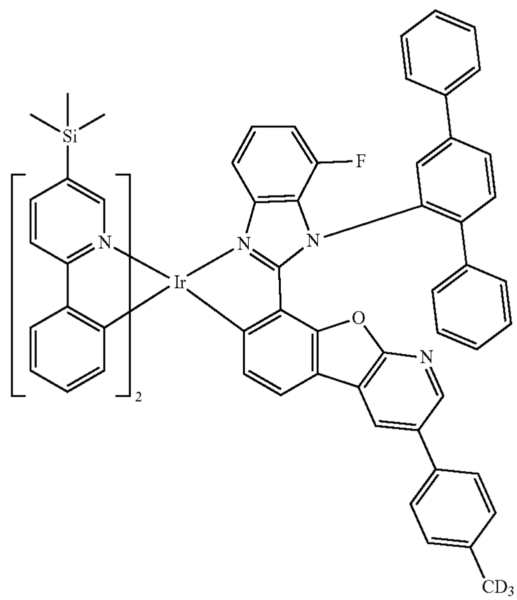

-continued
2957
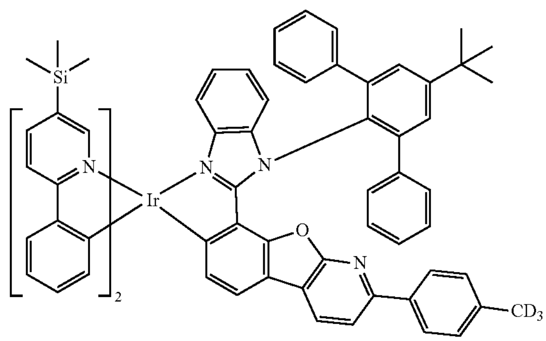
2958
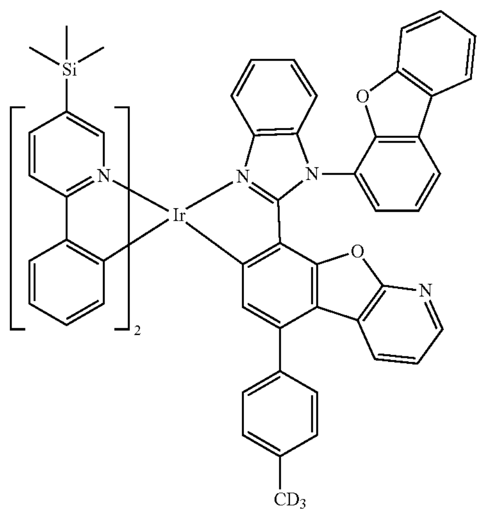
2959
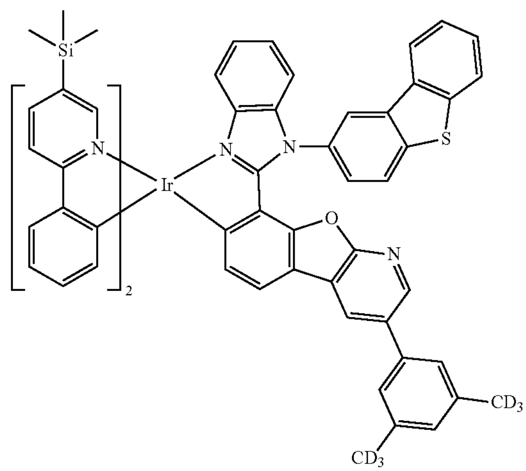
2960
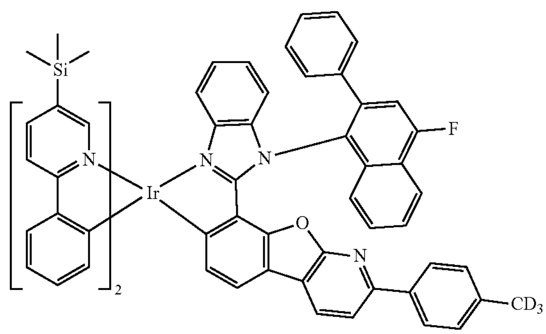
2961
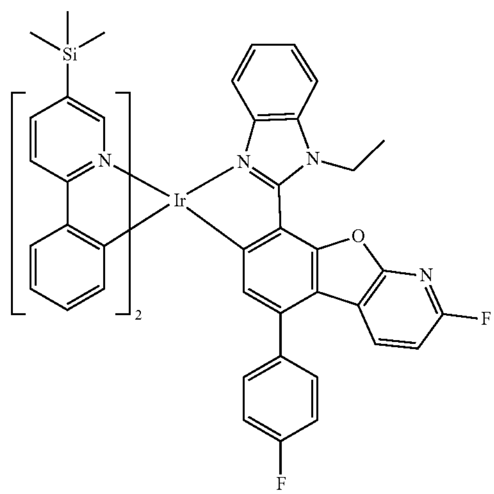

-continued
2962
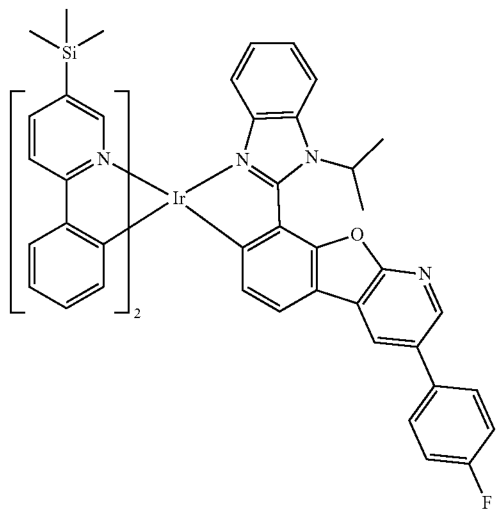
2963
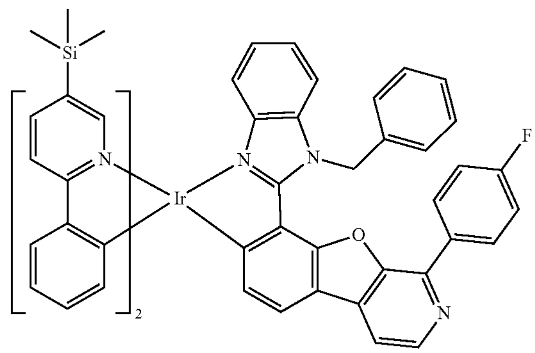
2964
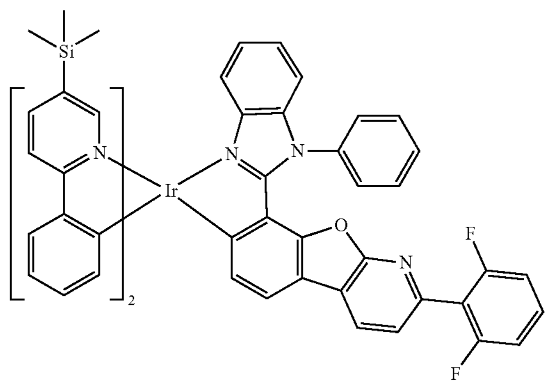
2965
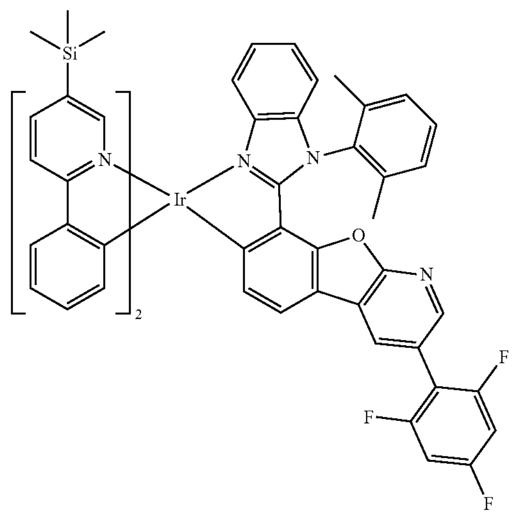
2966
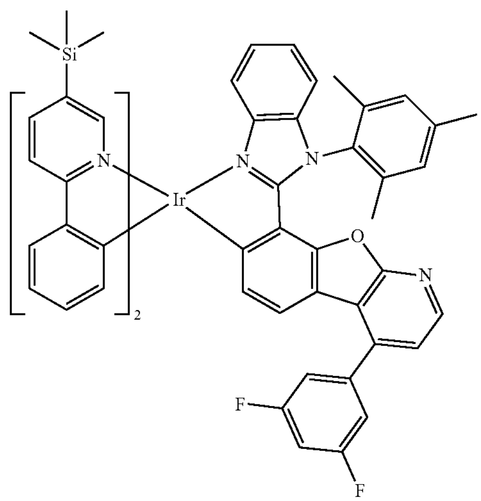
2967
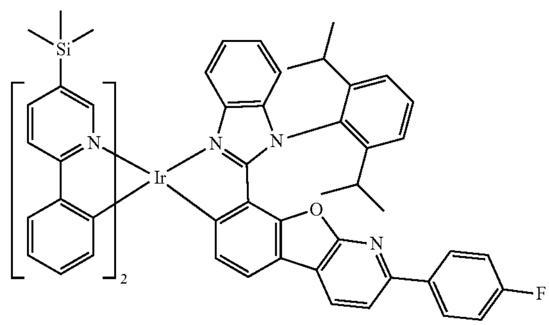

-continued
2968
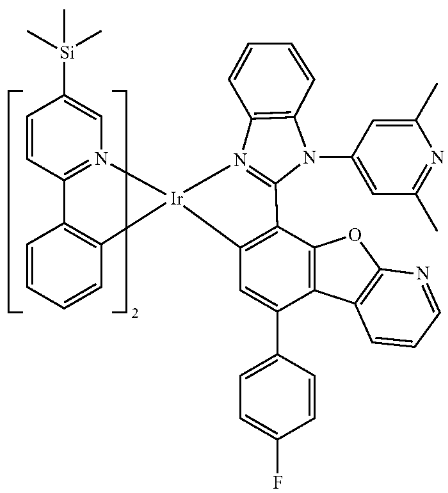
2969
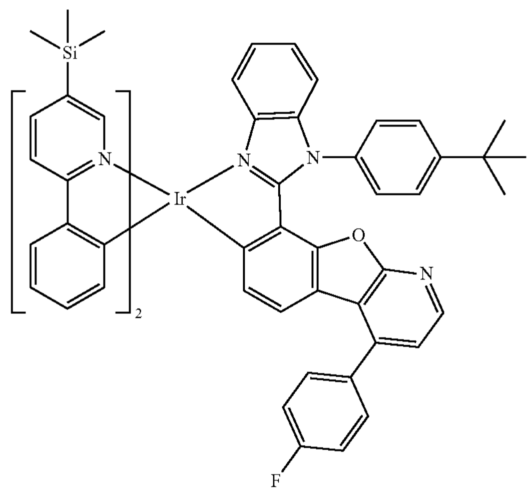
2970
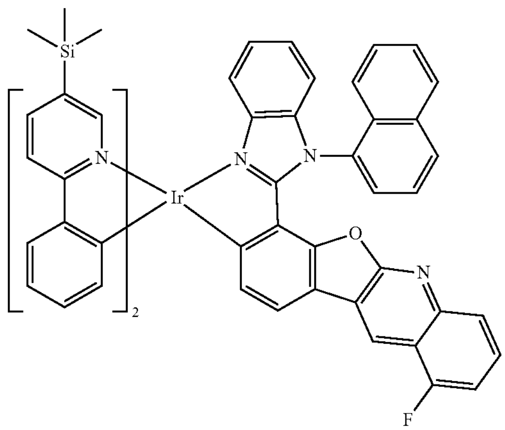
2971
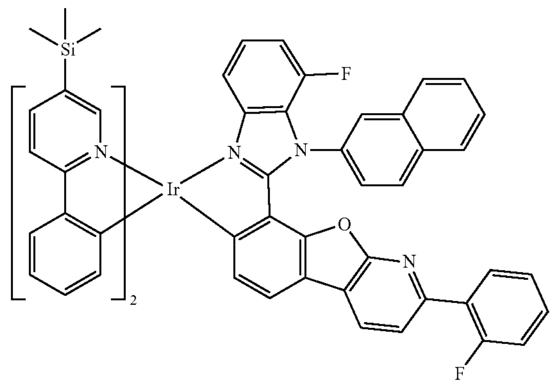
2972
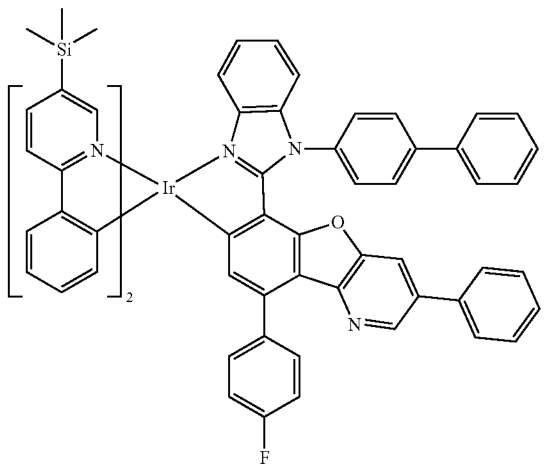
2973
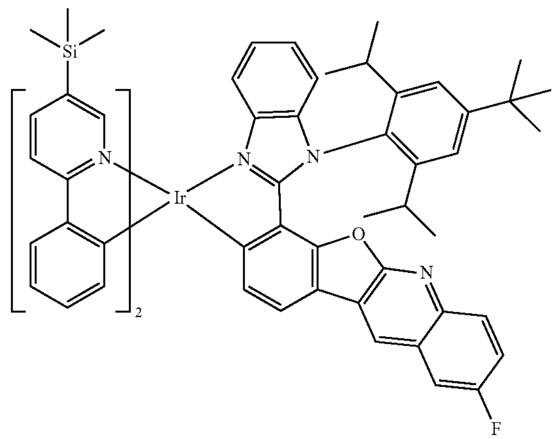

-continued
2974
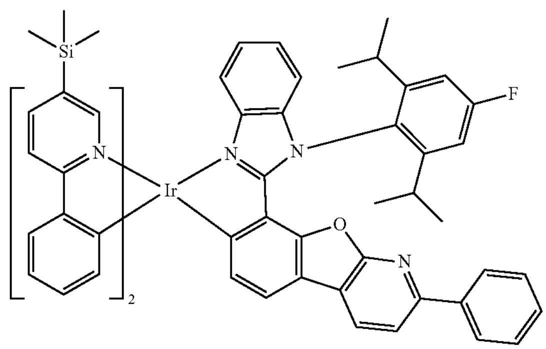
2975
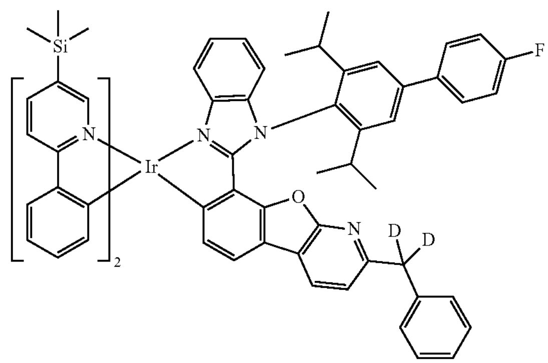
2976
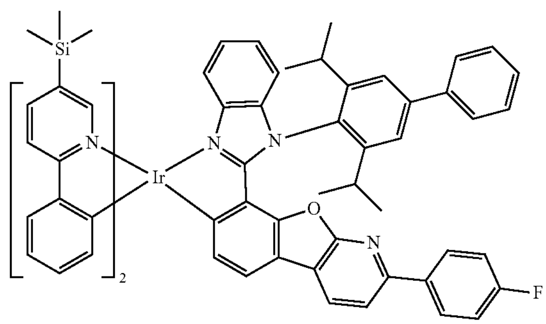
2977
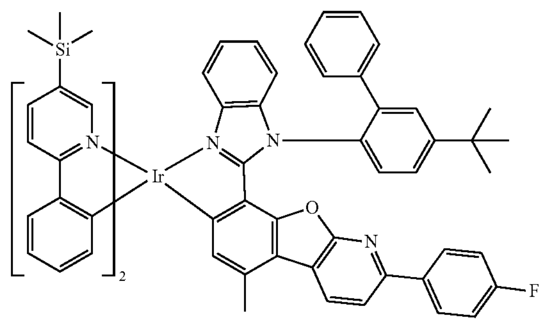
2978
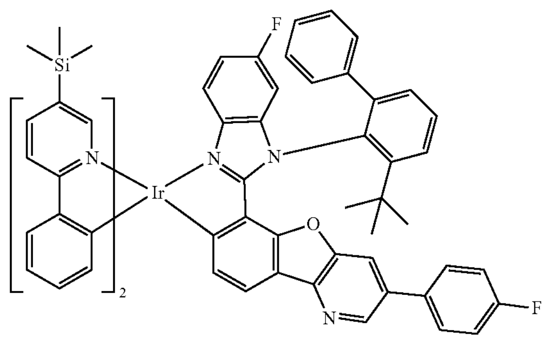
2979
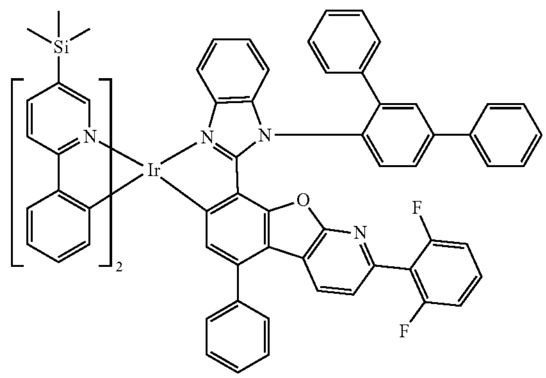

-continued
2980
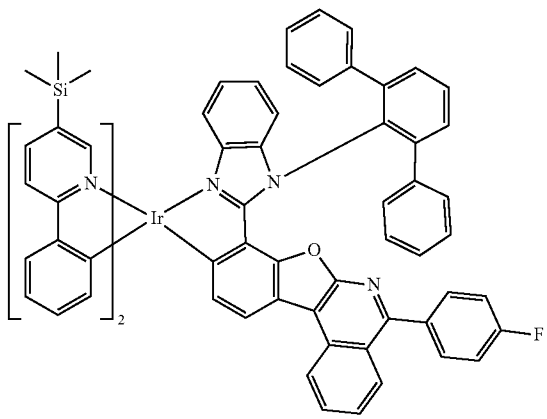
2981
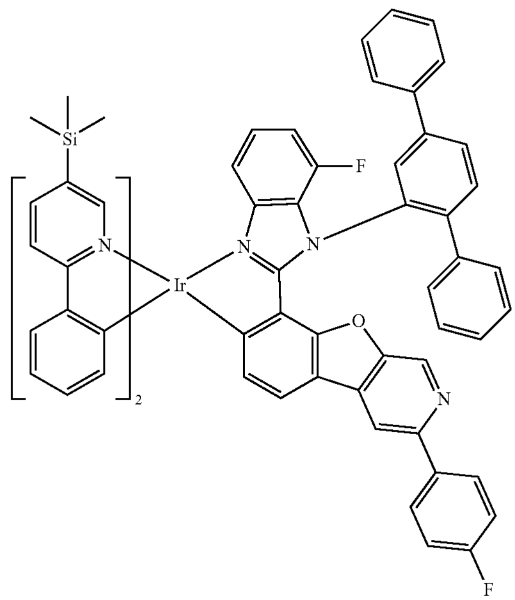
2982
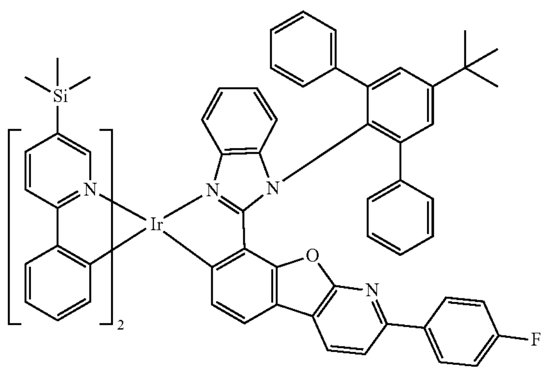
2983
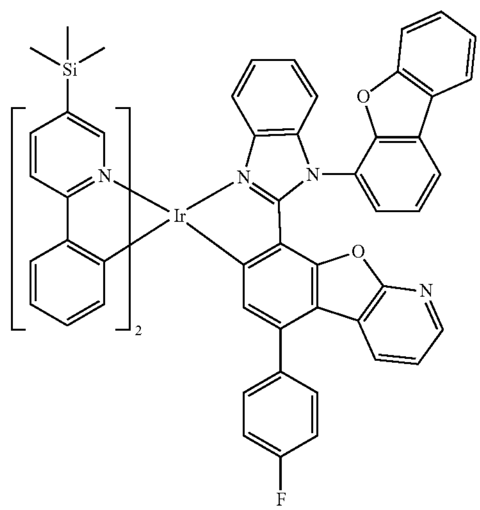
2984
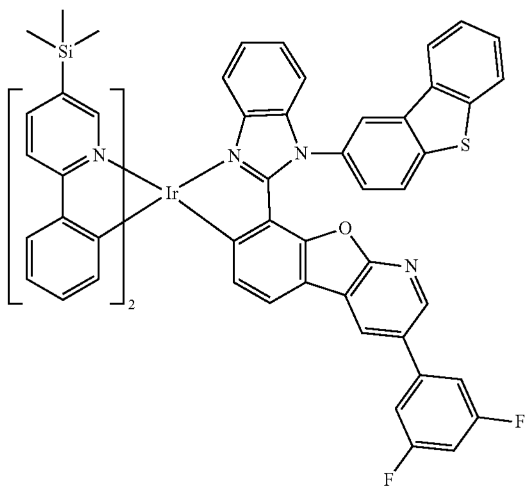
2985
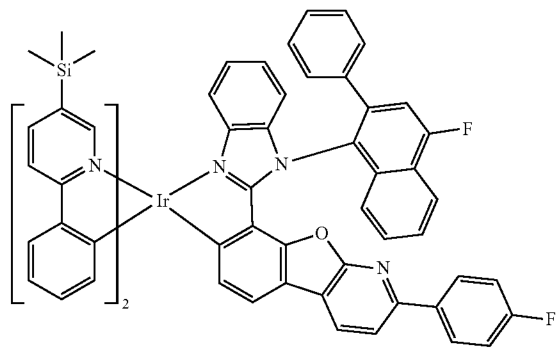

-continued
2986
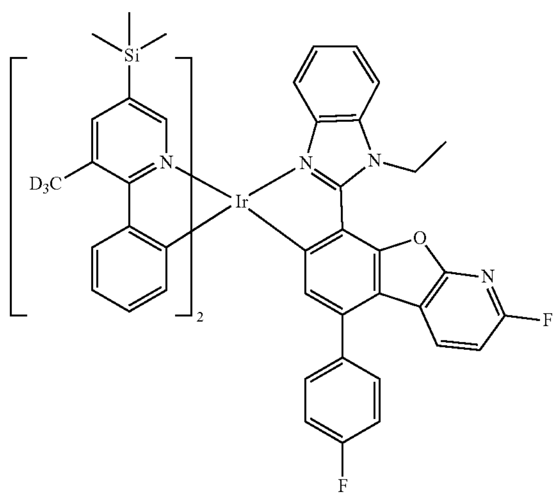
2987
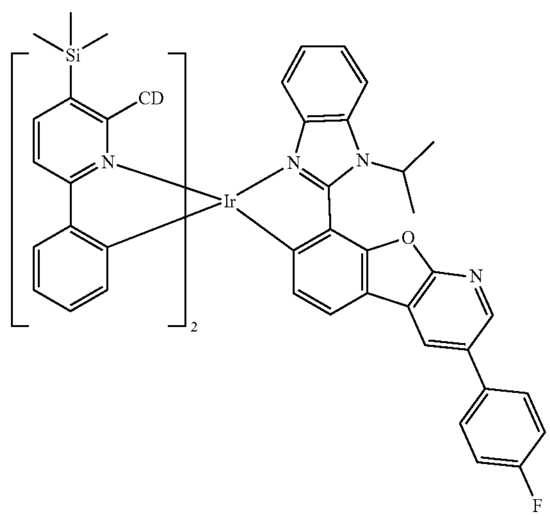
2988
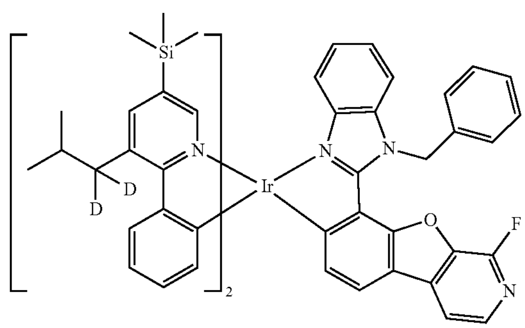
2989
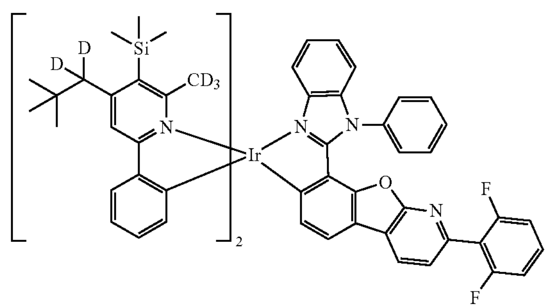
2990
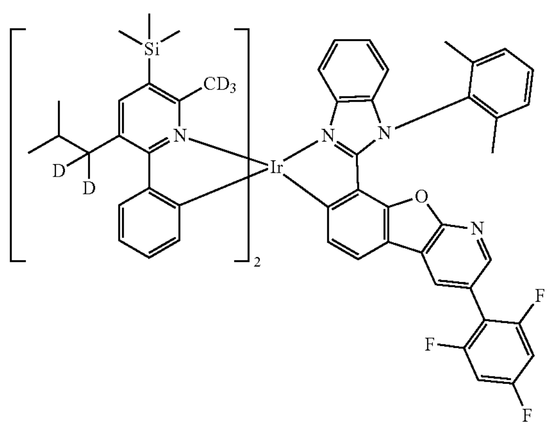
2991
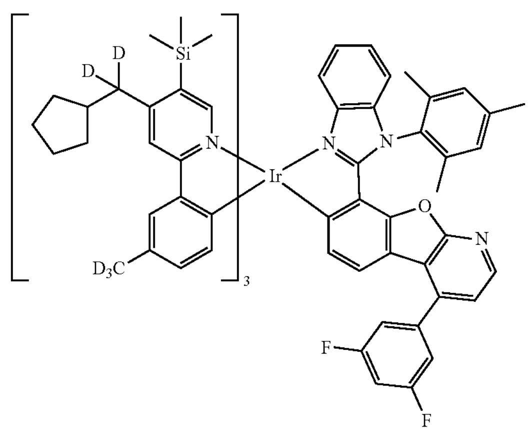

-continued
2992
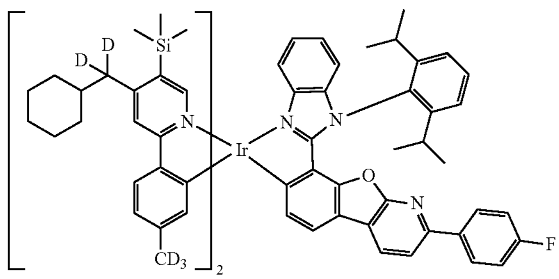
2993
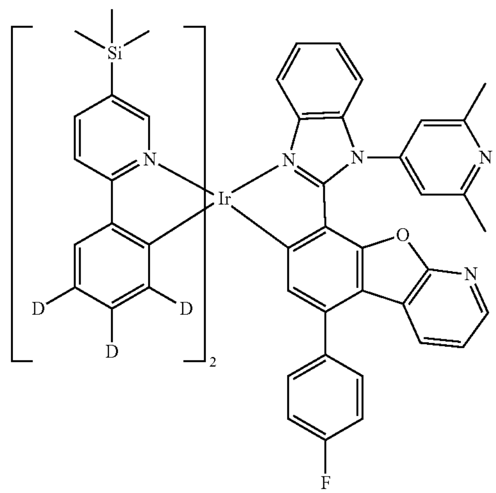
2994
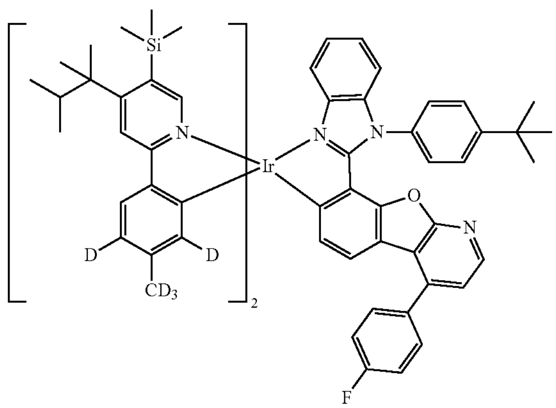
2995
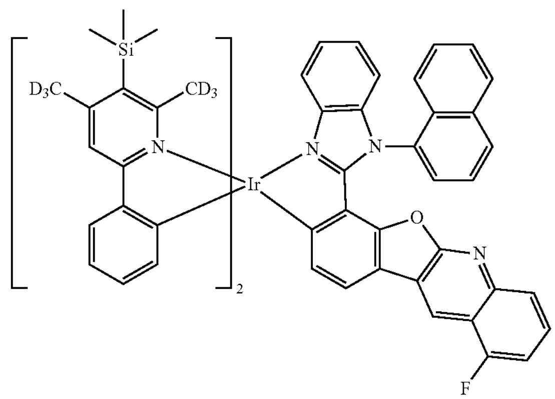
2996
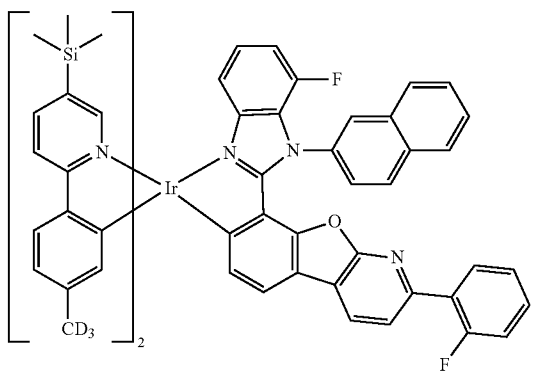
2997
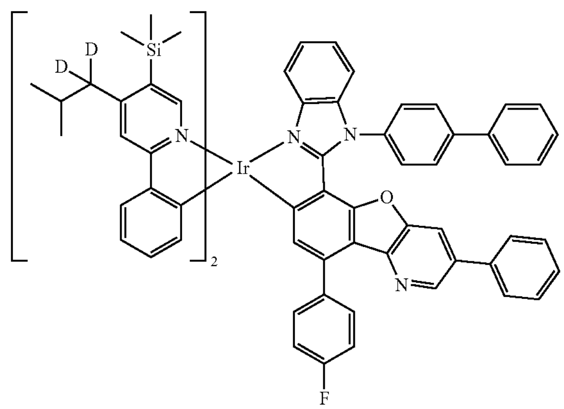

-continued
2998
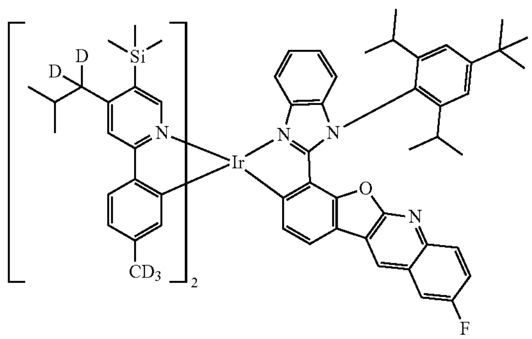
2999
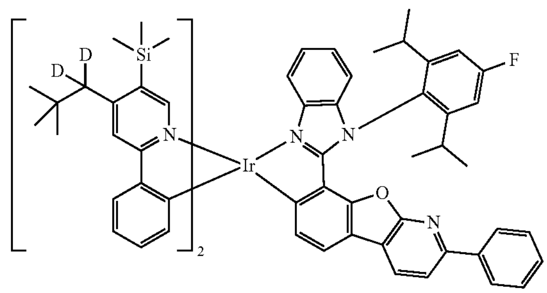
3000
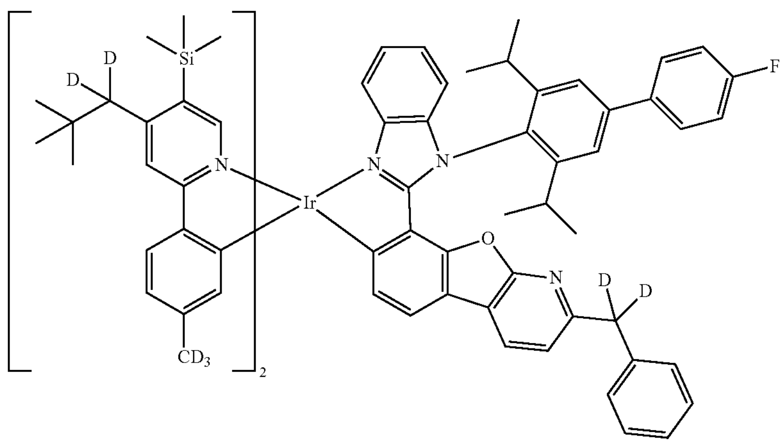
3001
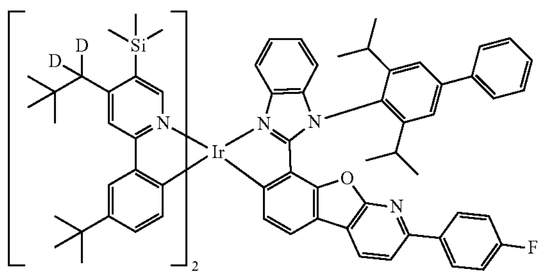
3002
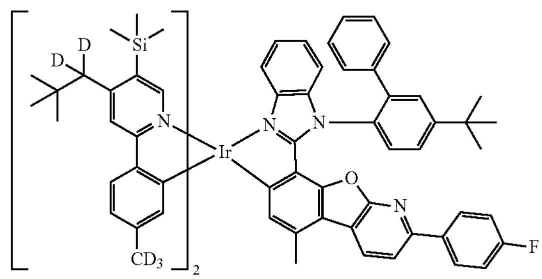
3003
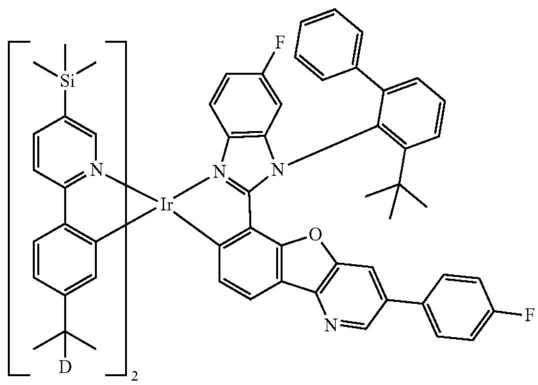
3004
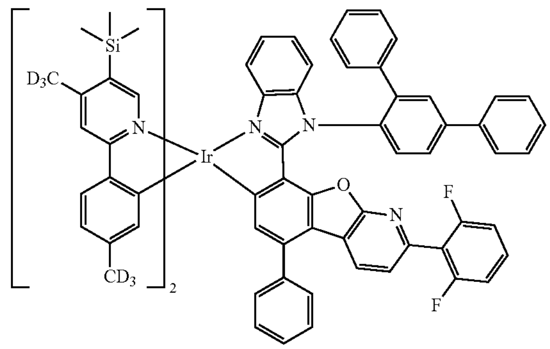

-continued
3005
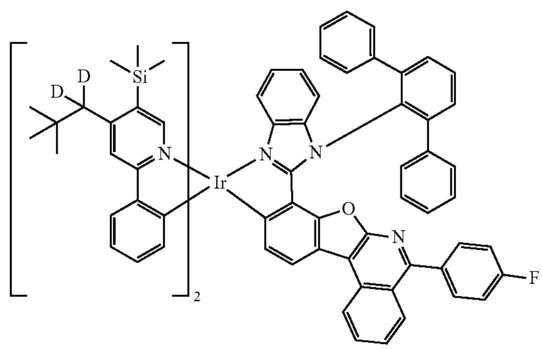
3006
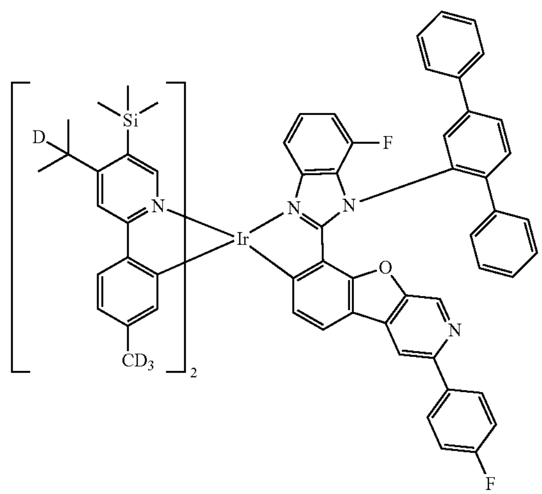
3007
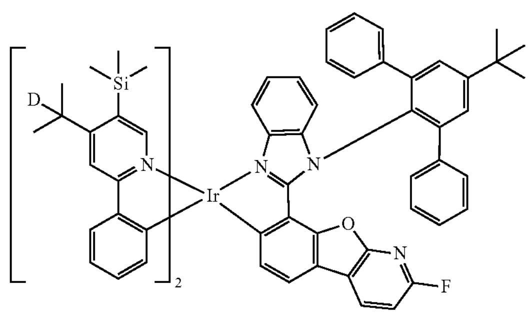
3008
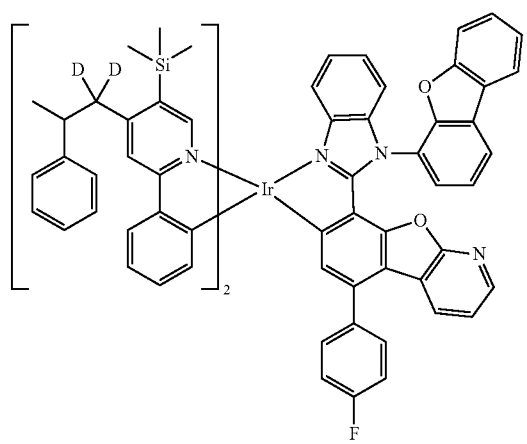
3009
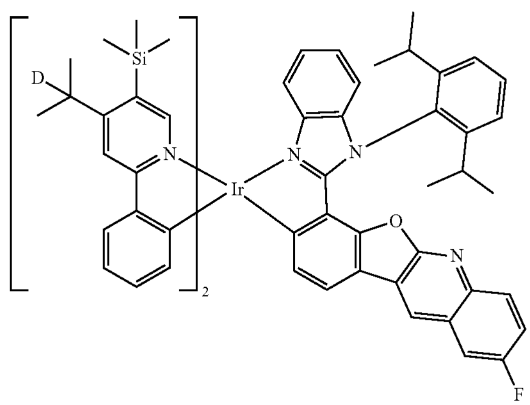
3010
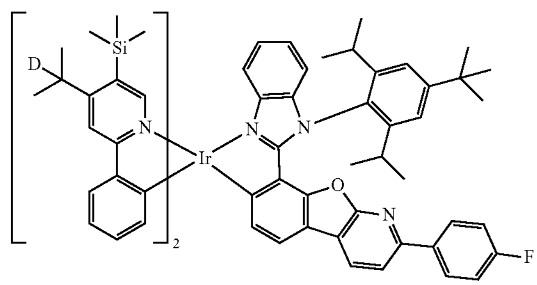

-continued
3011
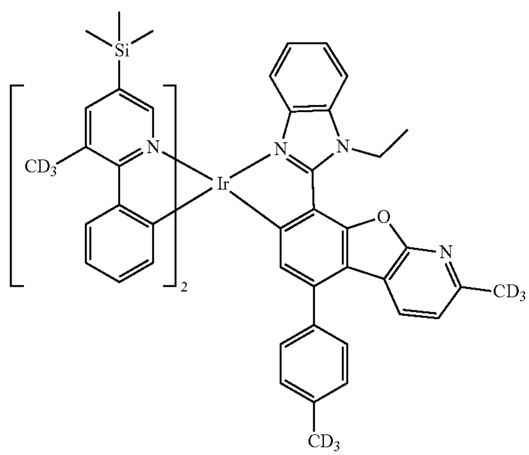
3012
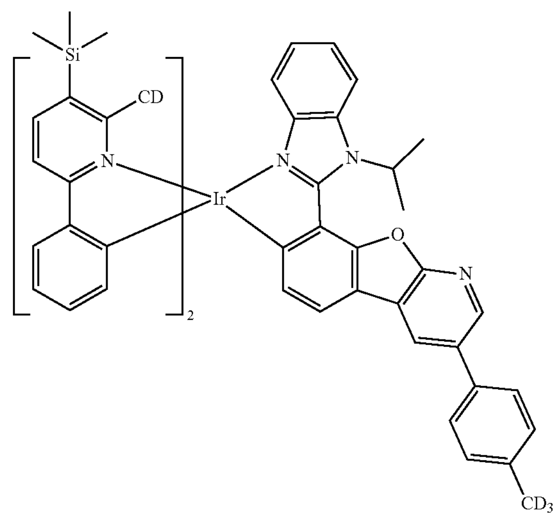
3013
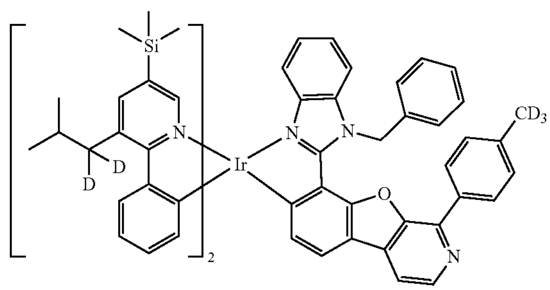
3014
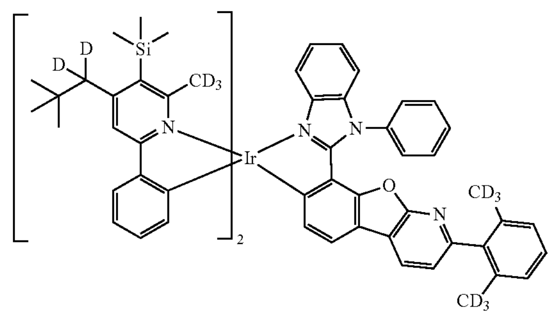
3015
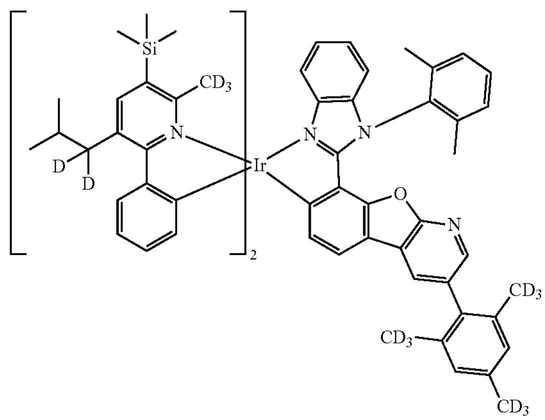
3016
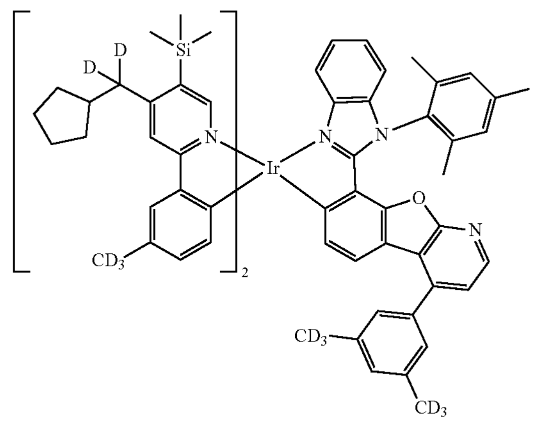

-continued
3017
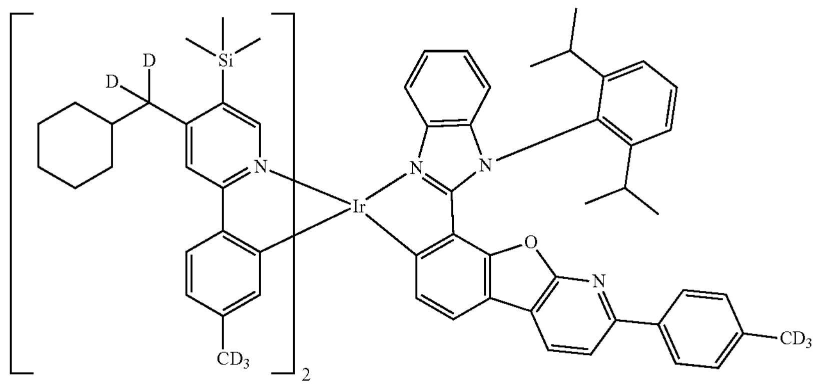
3018
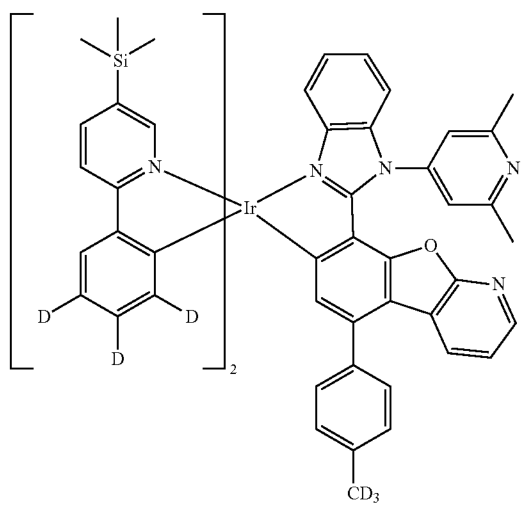
3019
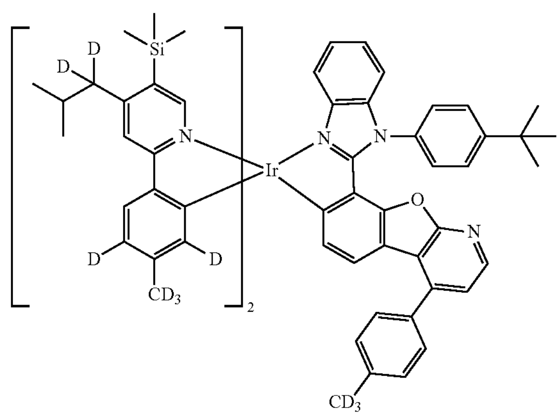
3020
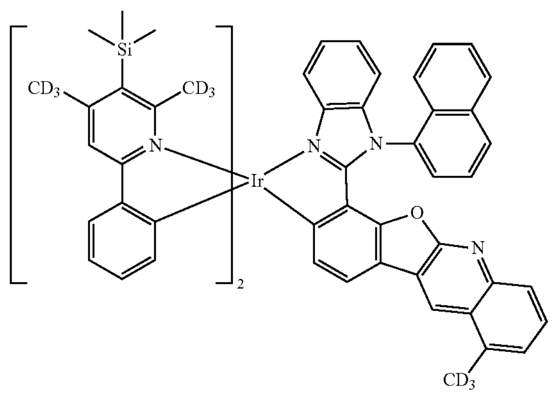
3021
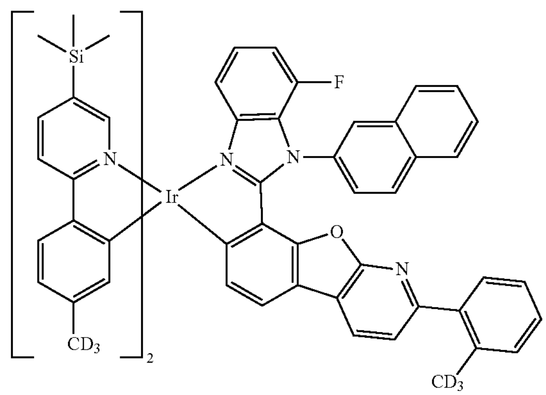

-continued
3022
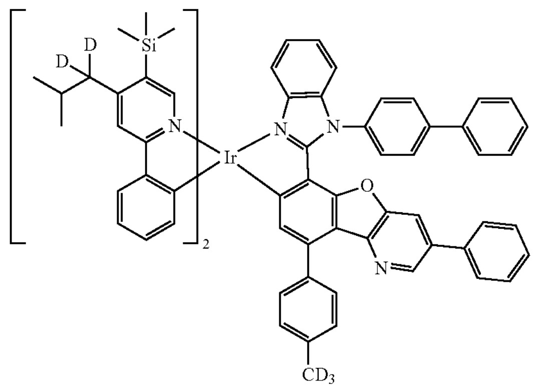
3023
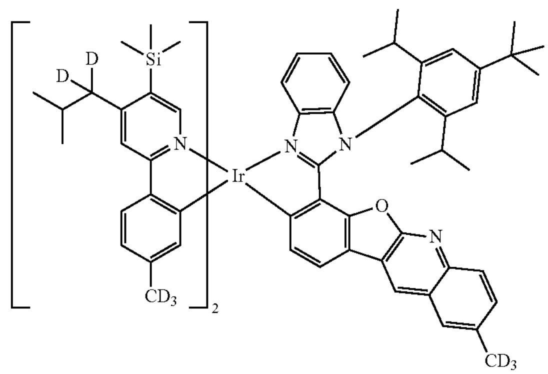
3024
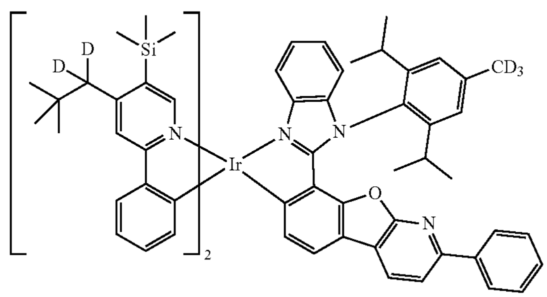
3025
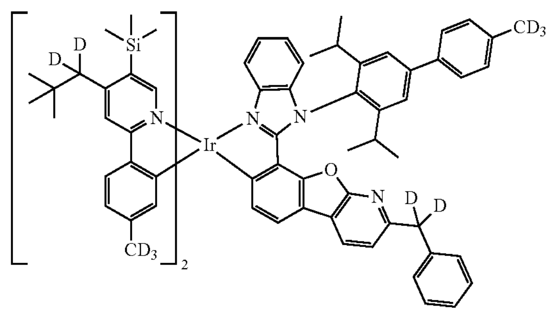
3026
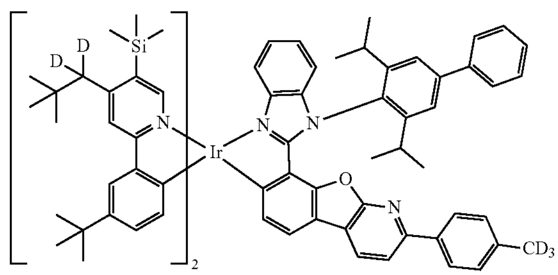
3027
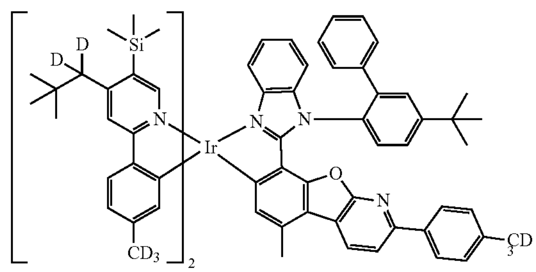
3028
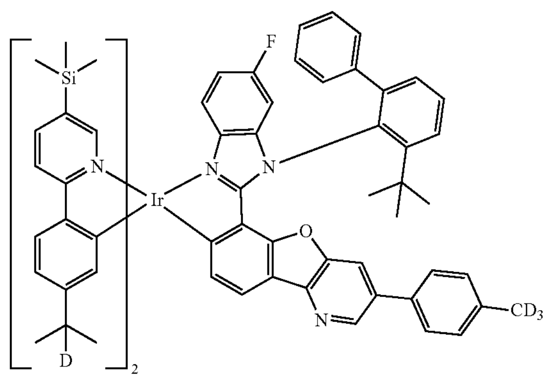
3029
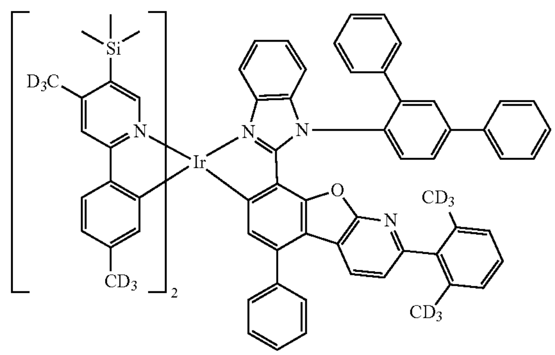

-continued
3030
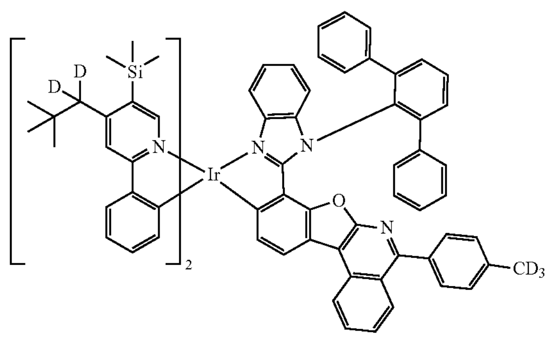
3031
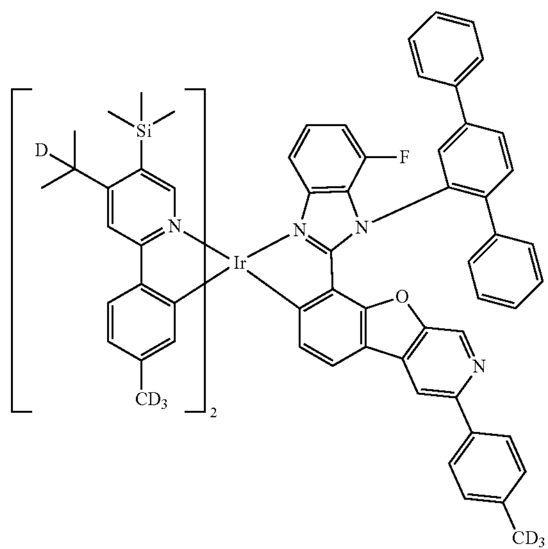
3032
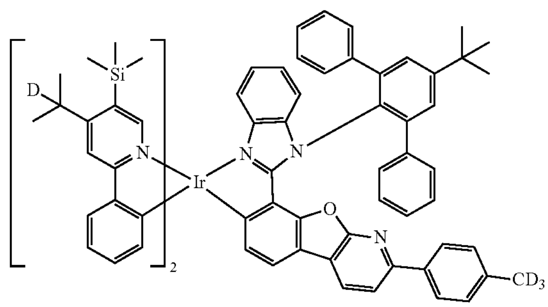
3033
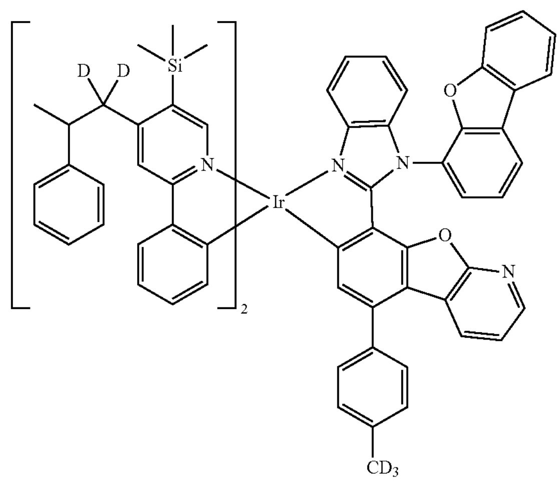
3034
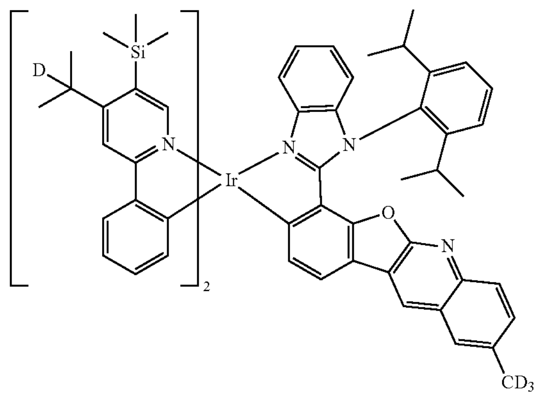
3035
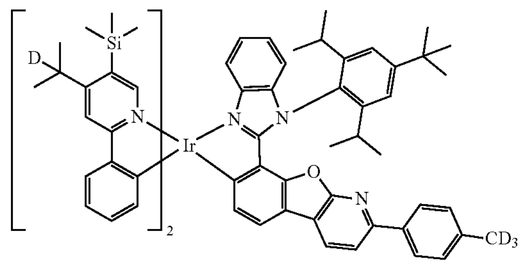

-continued
3036
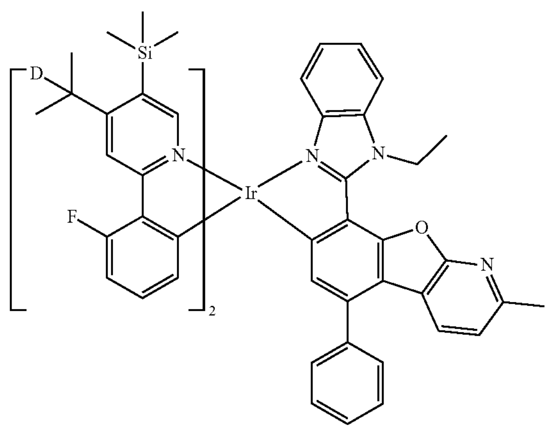
3037
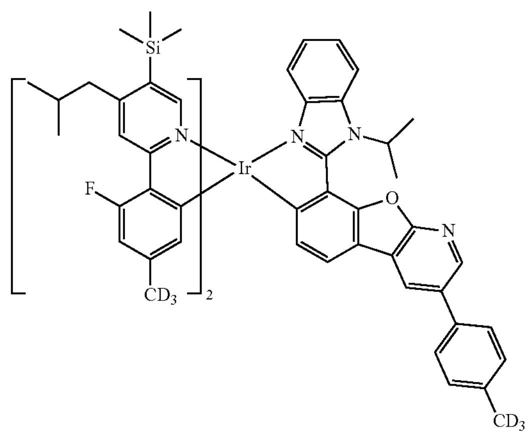
3038
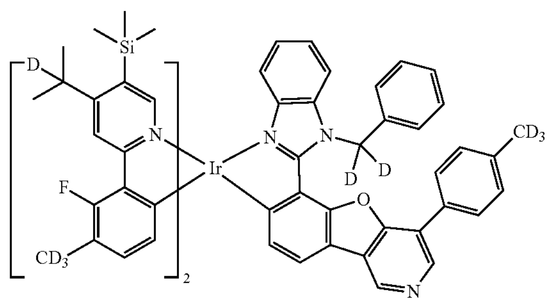
3039
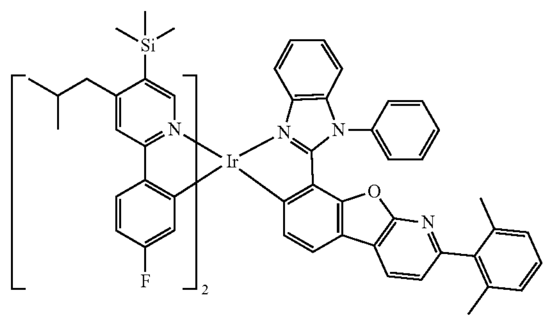
3040
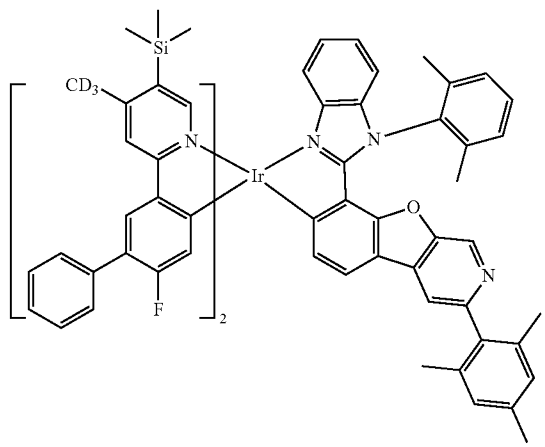
3041
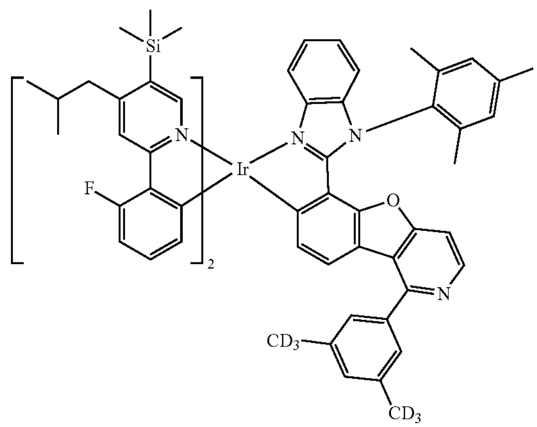

-continued
3042
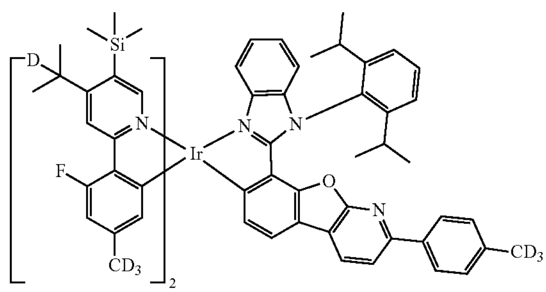
3043
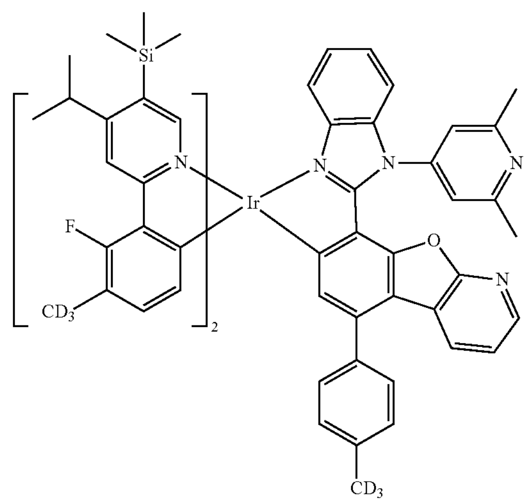
3044
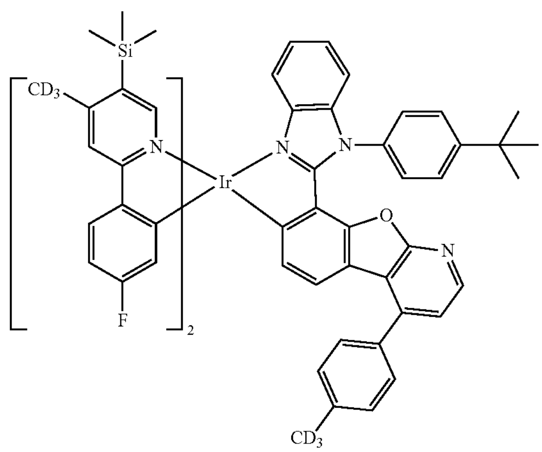
3045
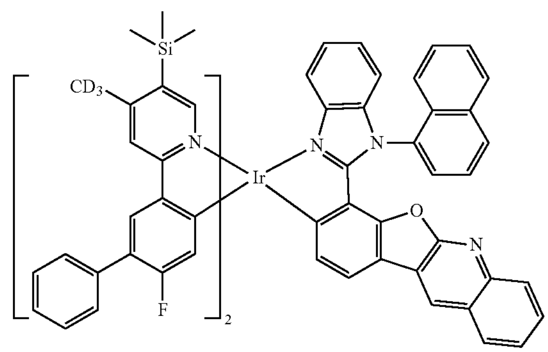
3046
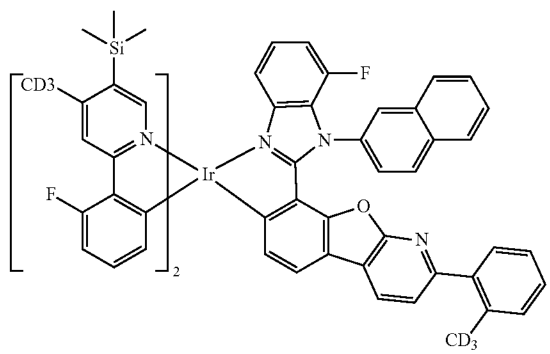
3047
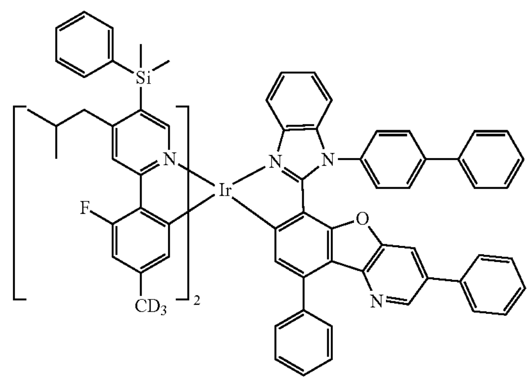

-continued
3048
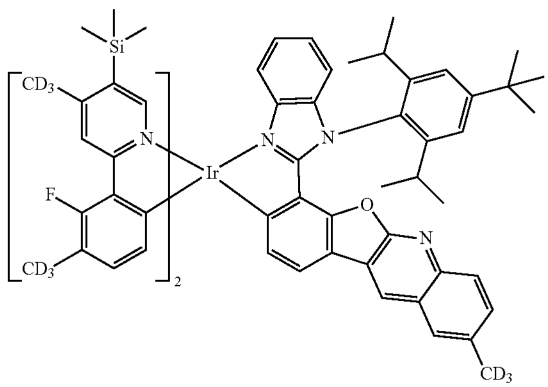
3049
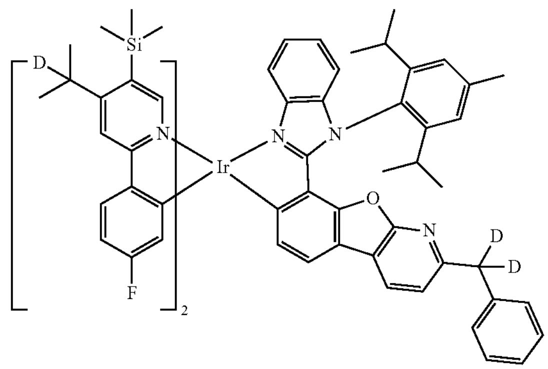
3050
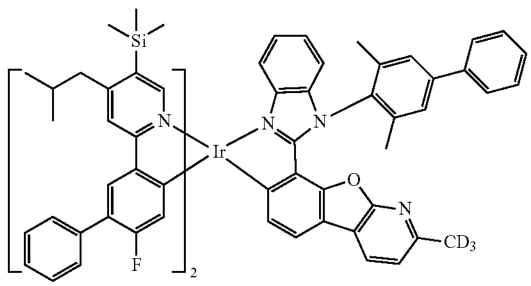
3051
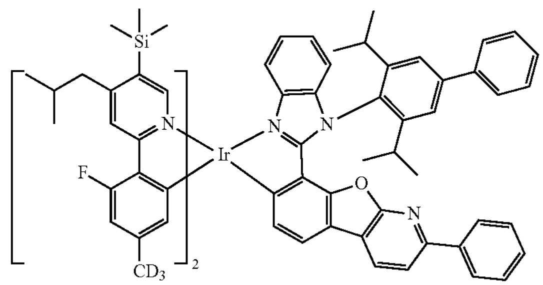
3052
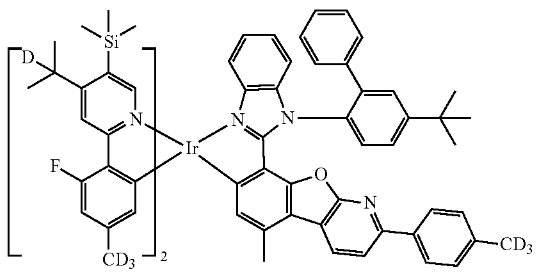
3053
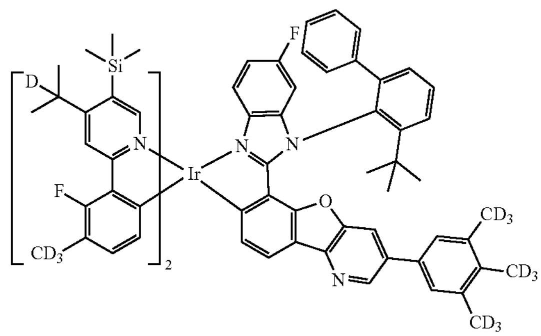
3054
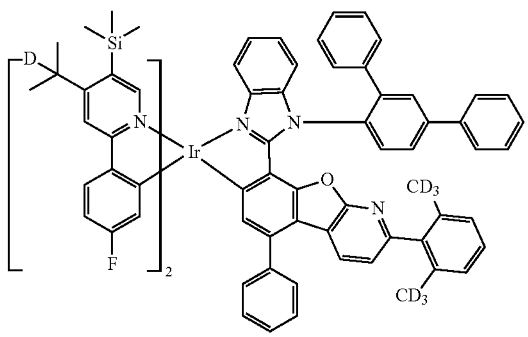
3055
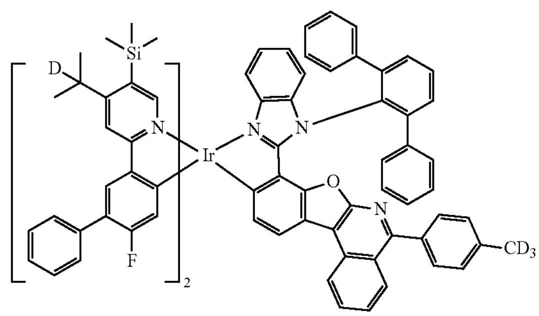

-continued
3056
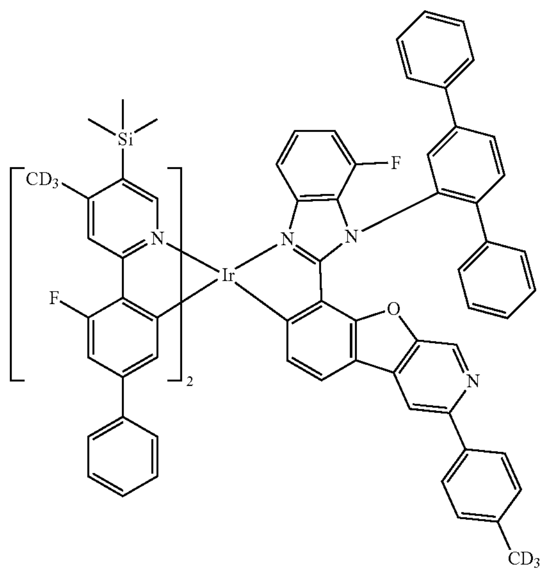
3057
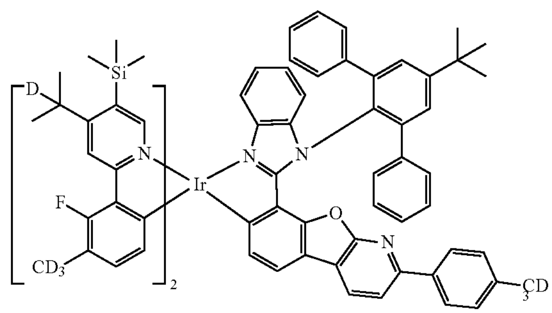
3058
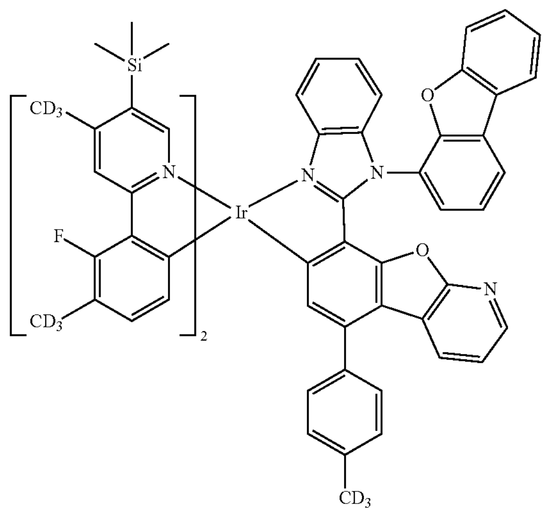
3059
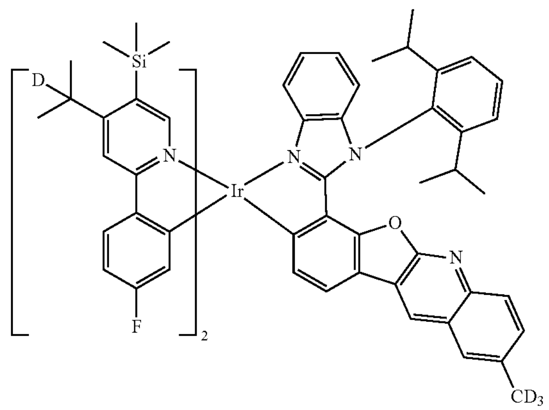
3060
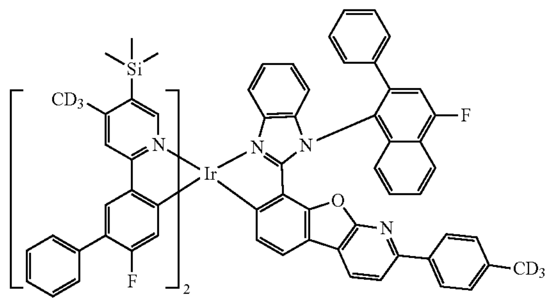
3061
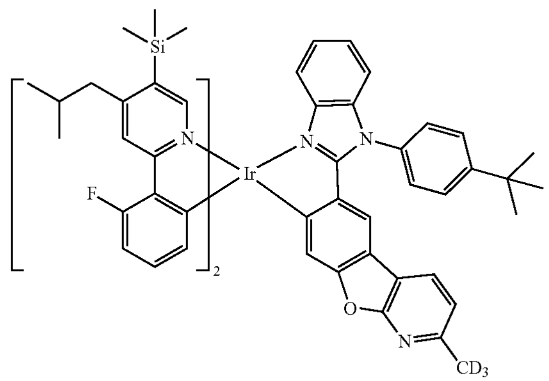

-continued
3062
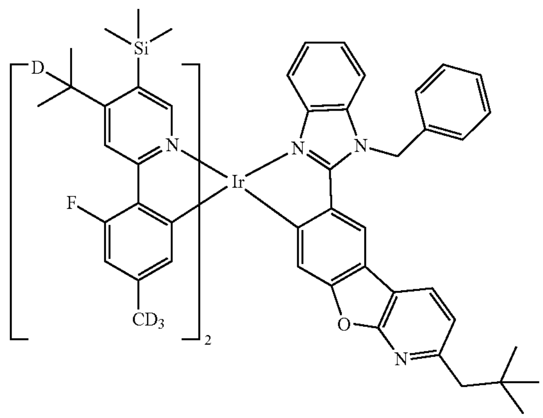
3063
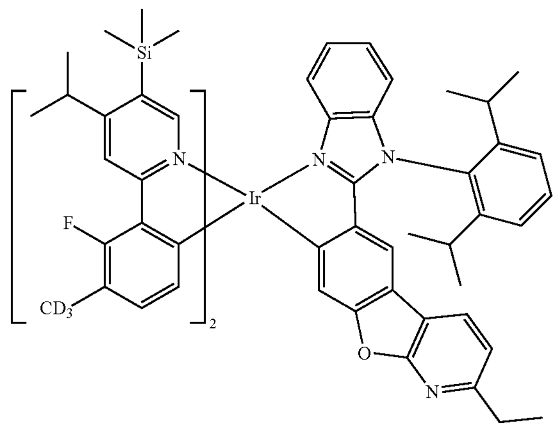
3064
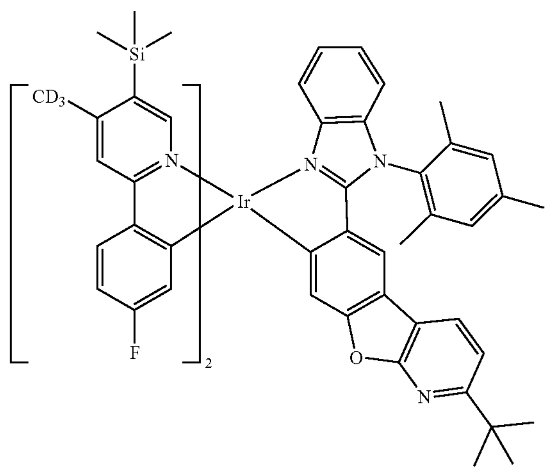
3065
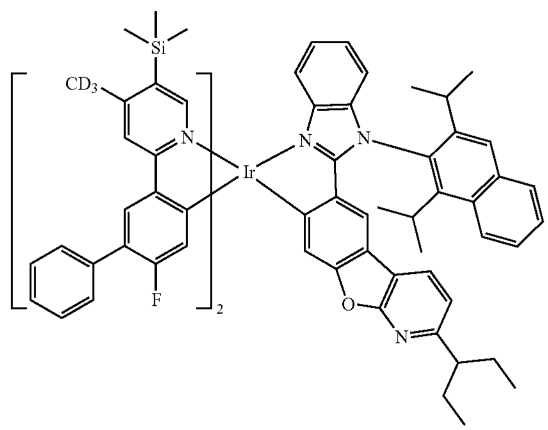
3066
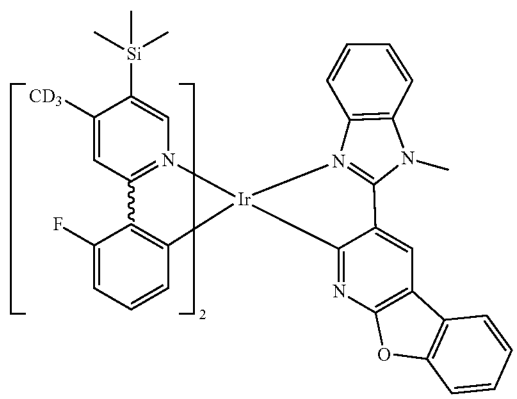
3067
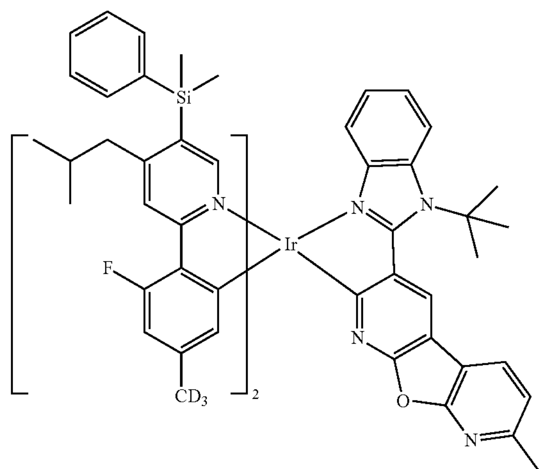

-continued
3068
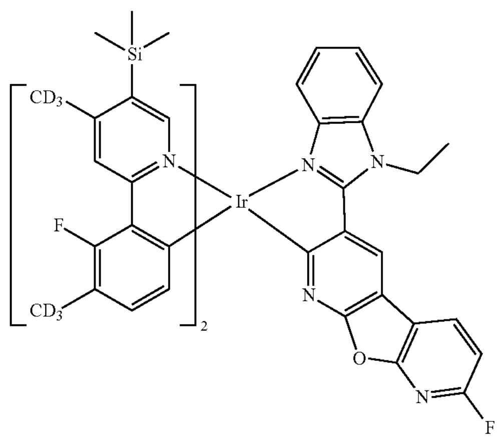
3069
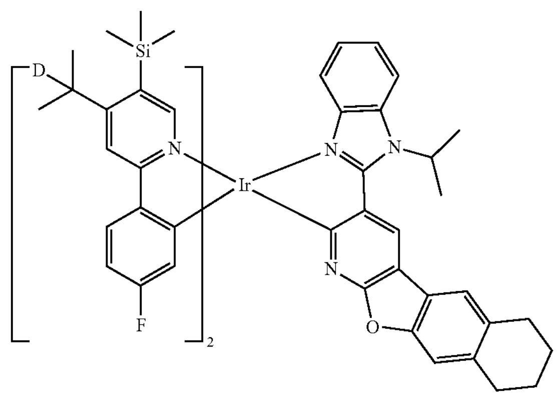
3070
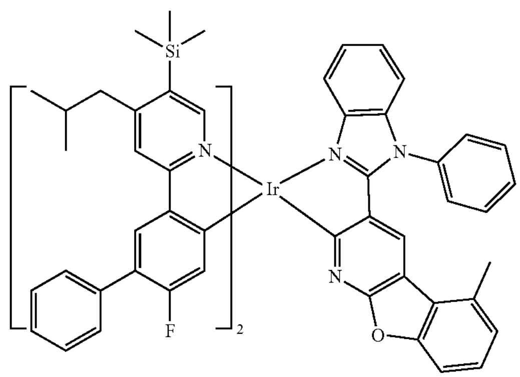
3071
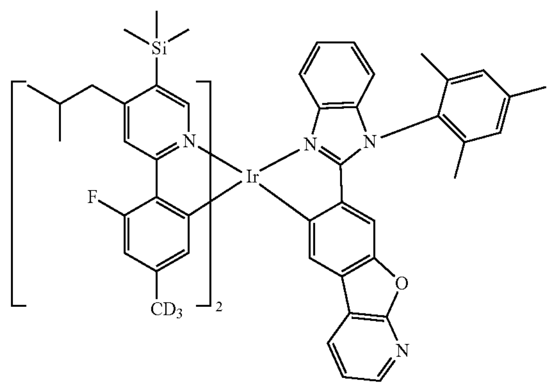
3072
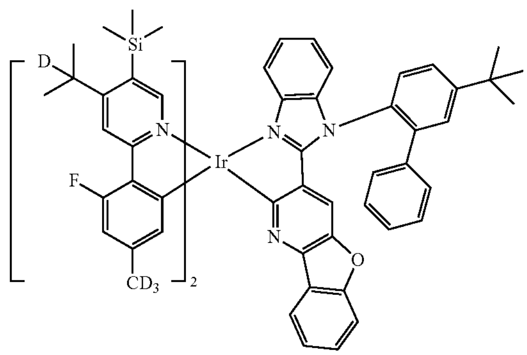
3073
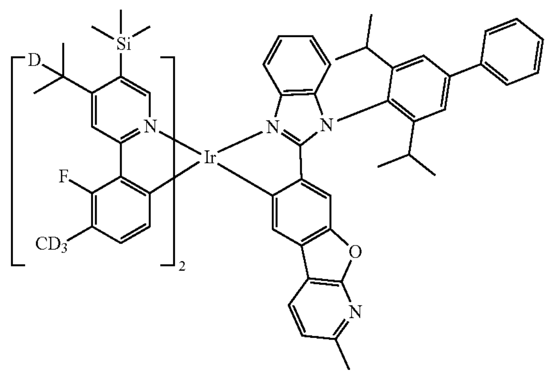

-continued
3074
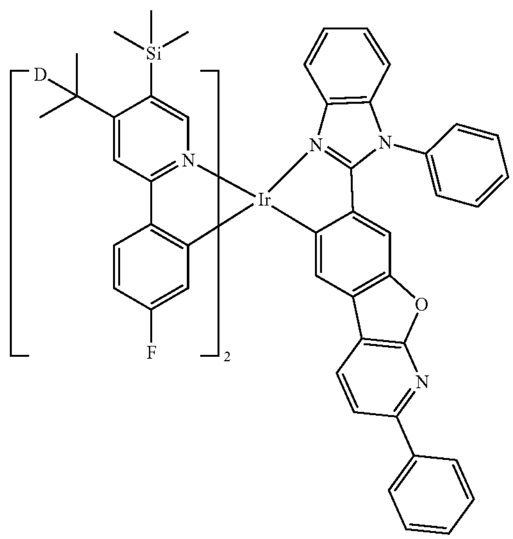
3075
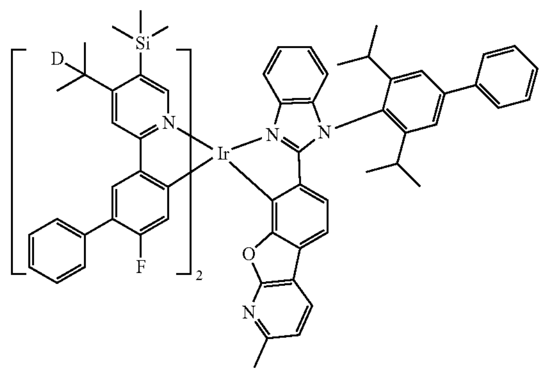
3076
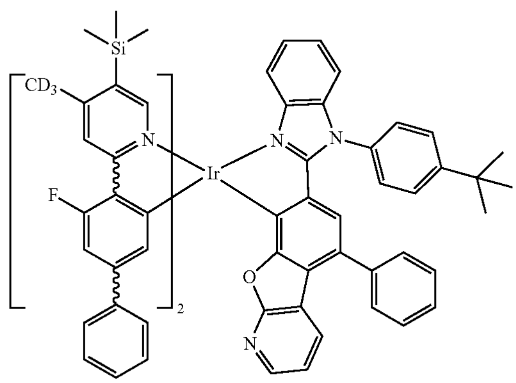
3077
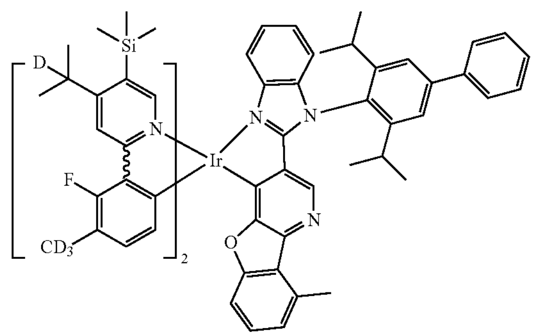
3078
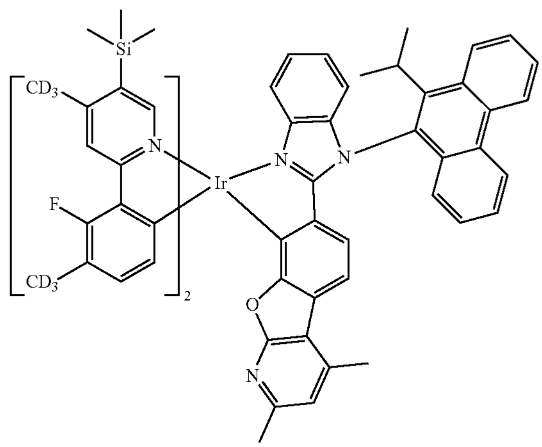
3079
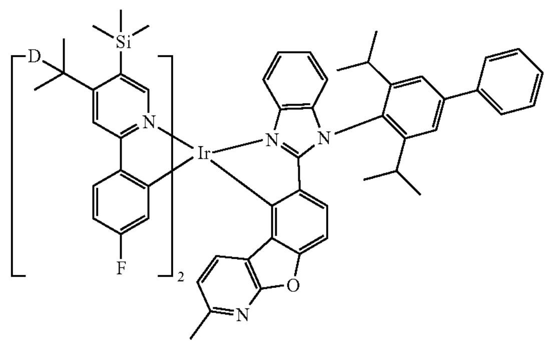

-continued
3080
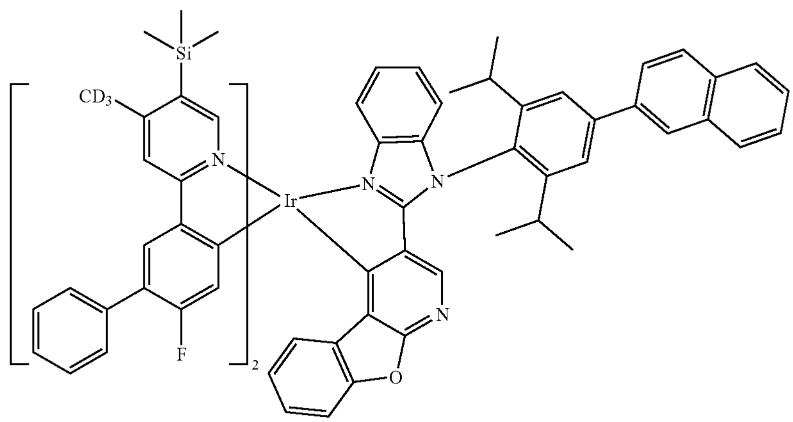
3081
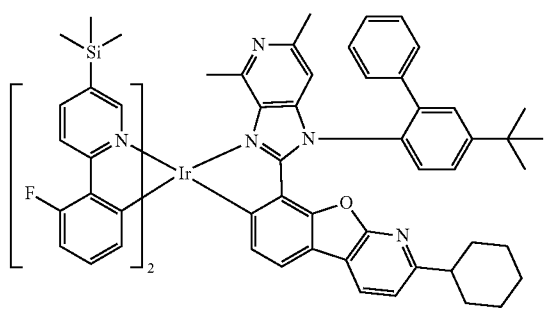
3082
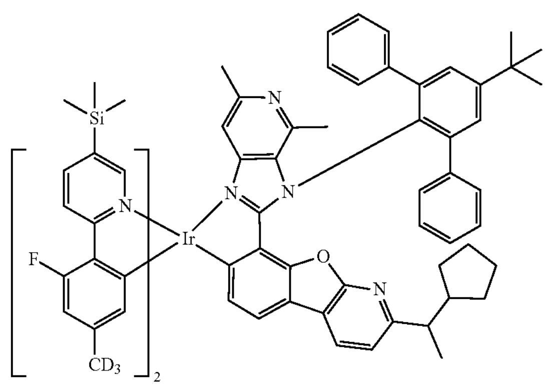
3083
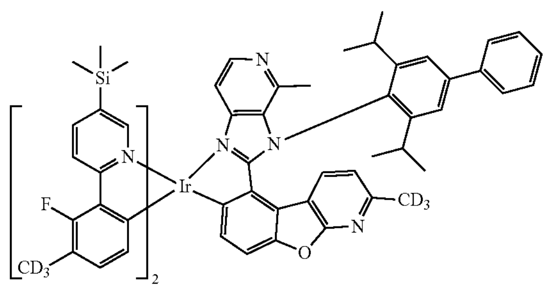
3084
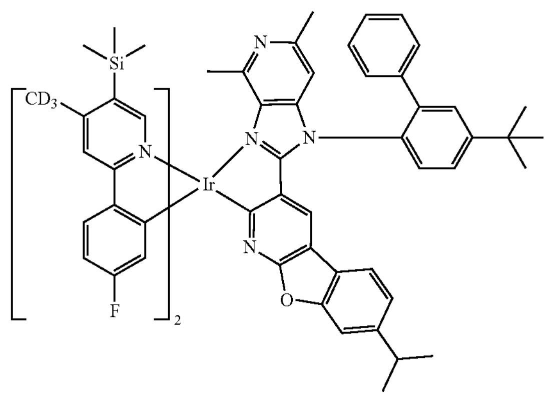

-continued
3085
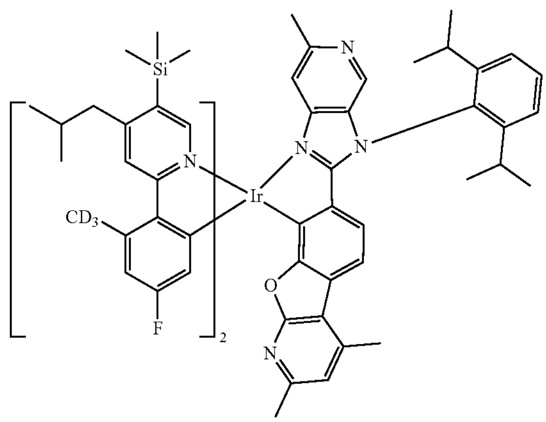
3086
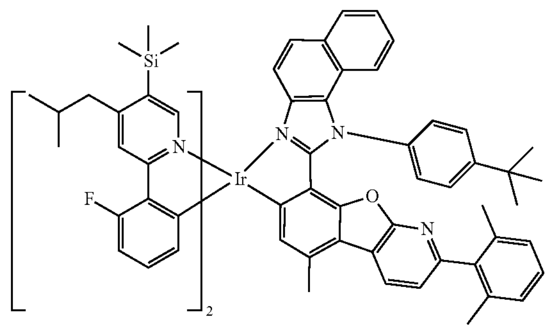
3087
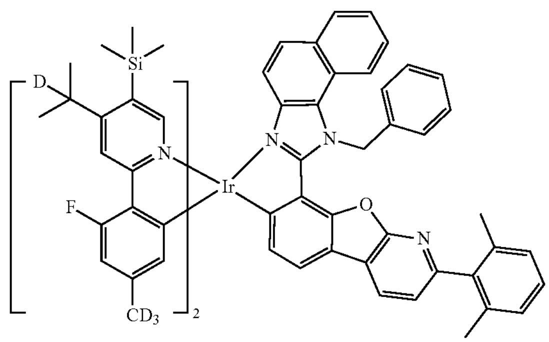
3088
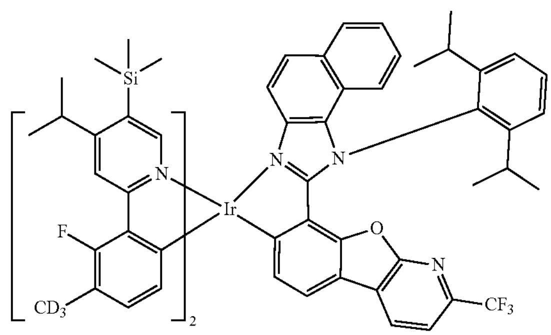
3089
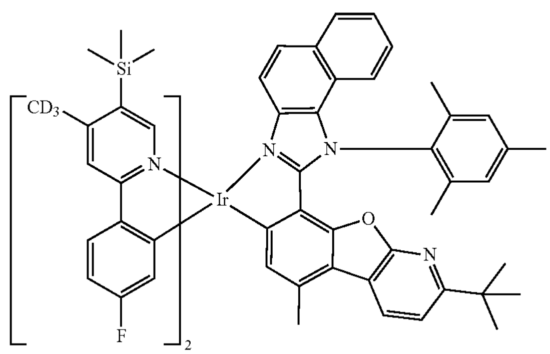
3090
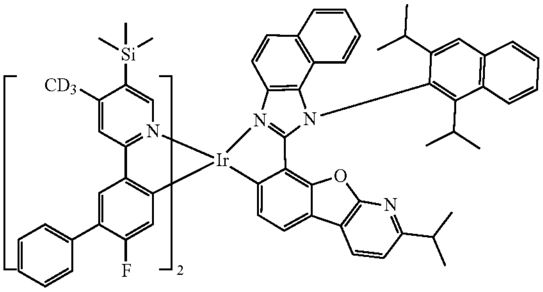
3091
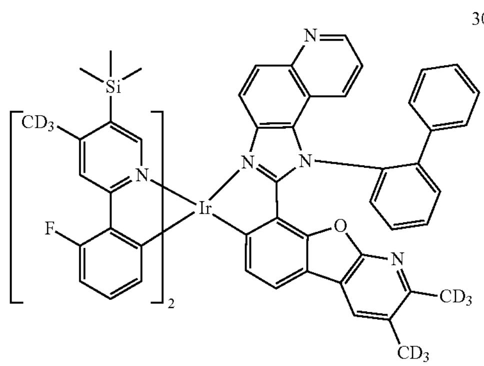
3092
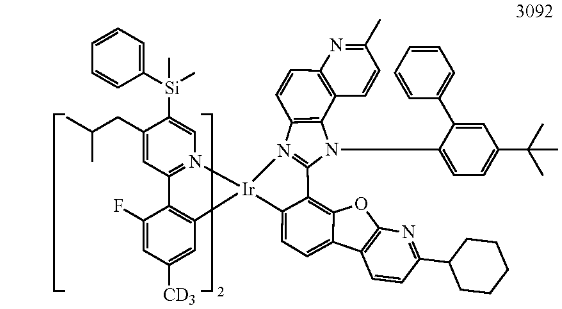

-continued
3093
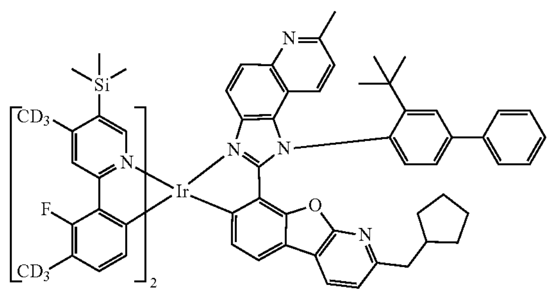
3094
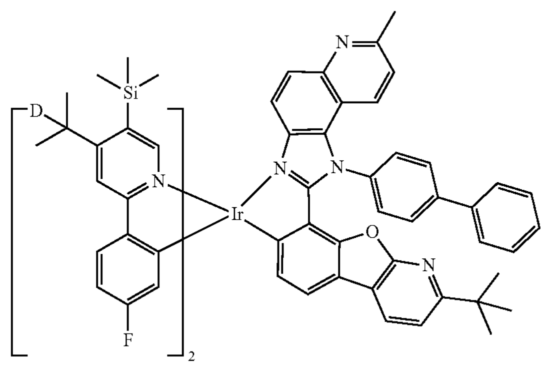
3095
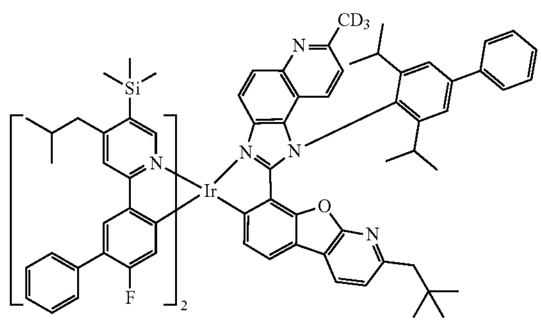
3096
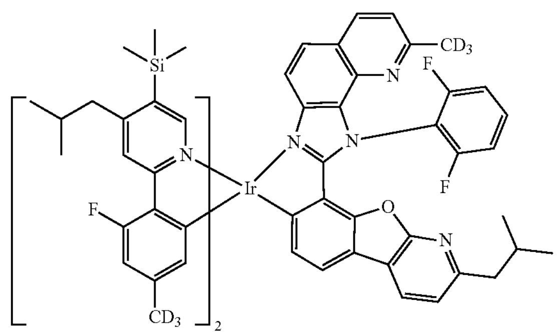
3097
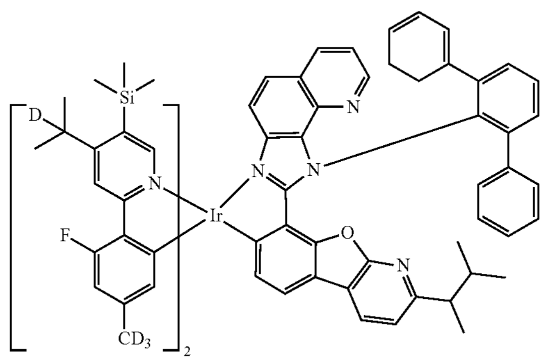
3098
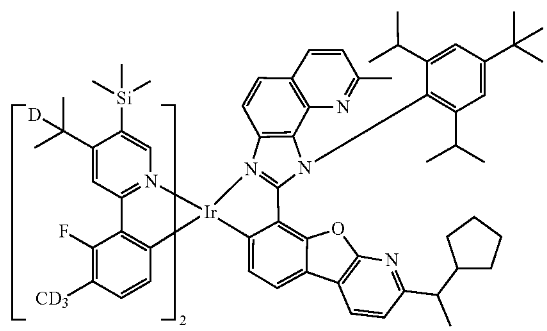
3099
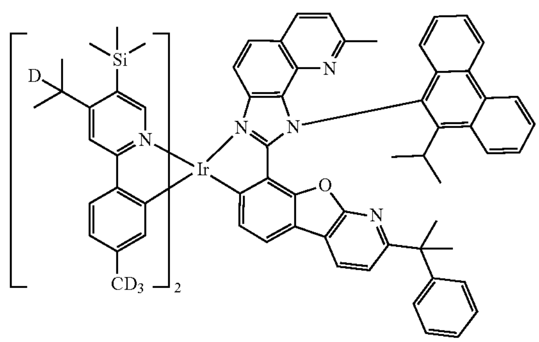

-continued
3100
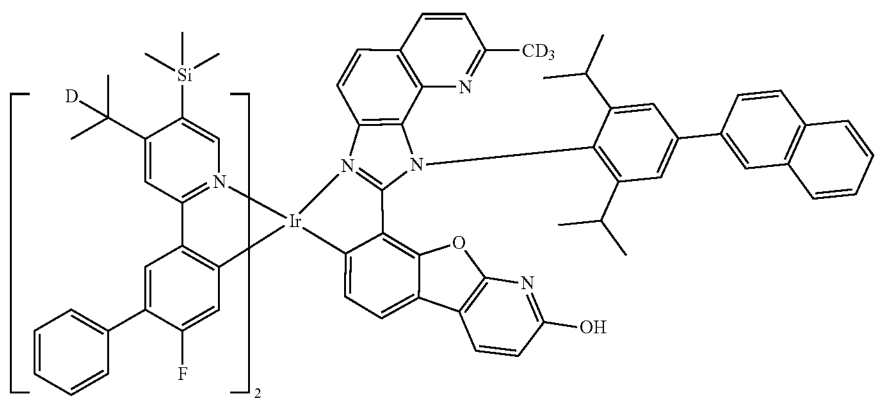
3101
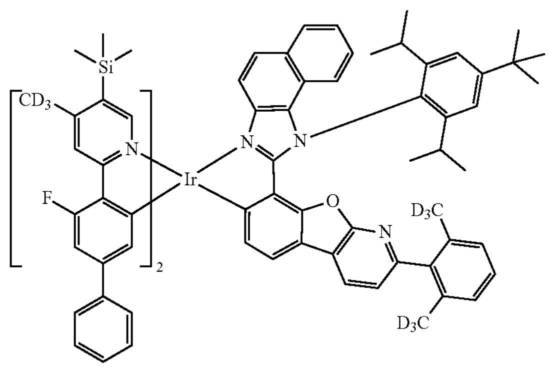
3102
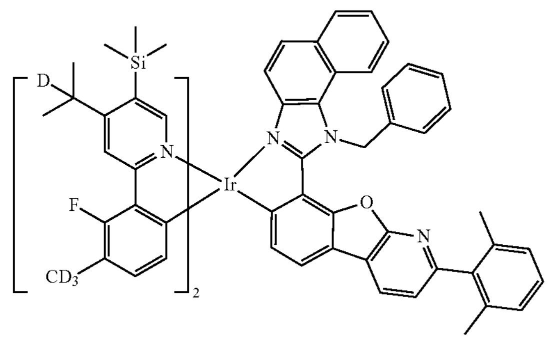
3103
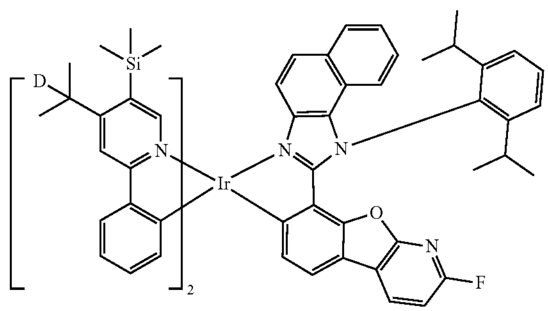
3104
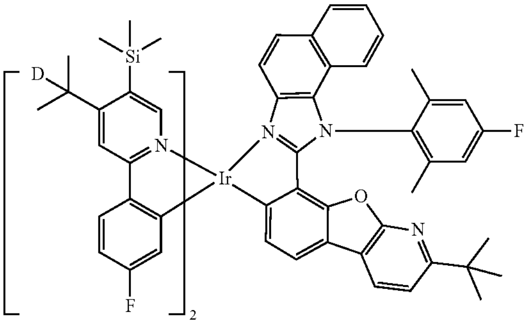
3105
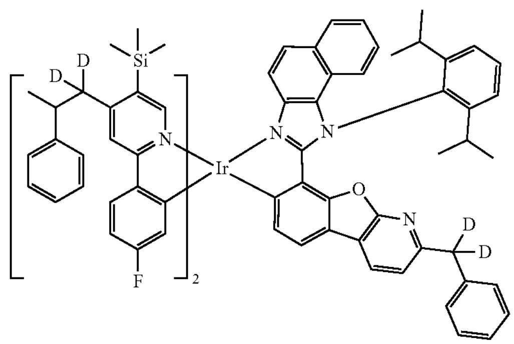
3106
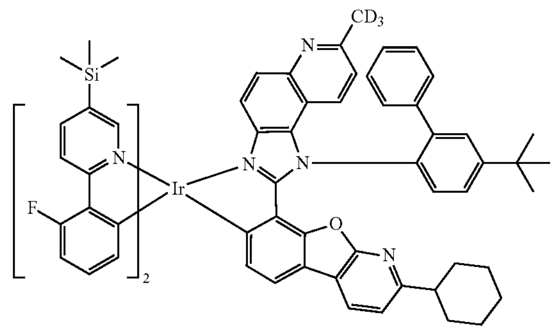

-continued
3107
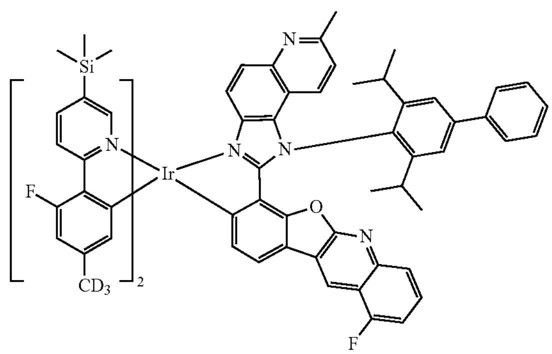
3108
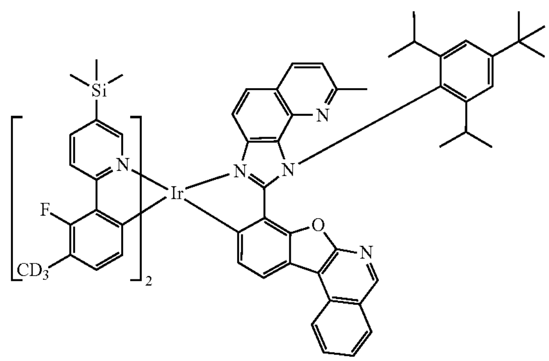
3109
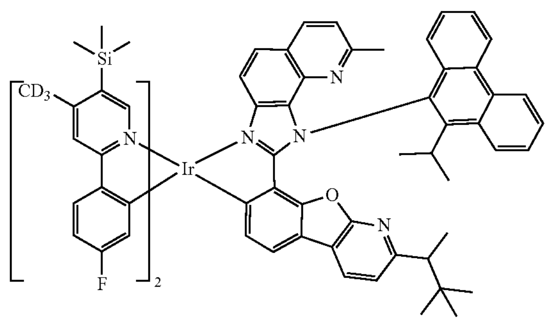
3110
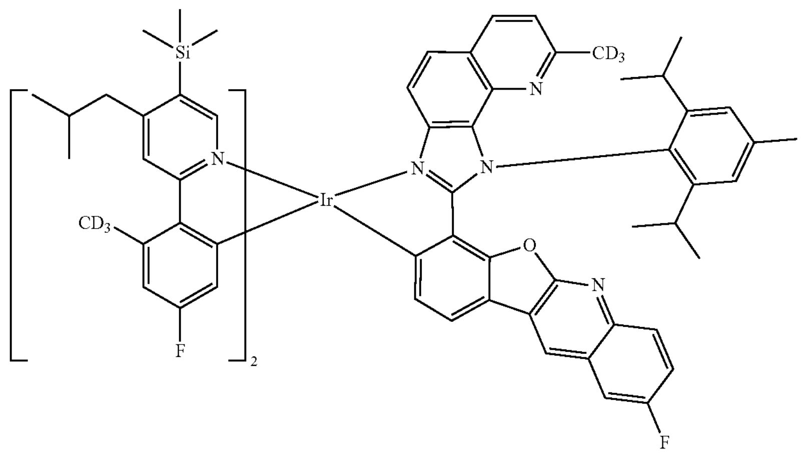
3111
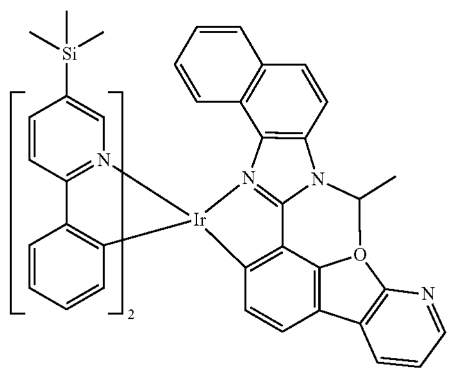
3112
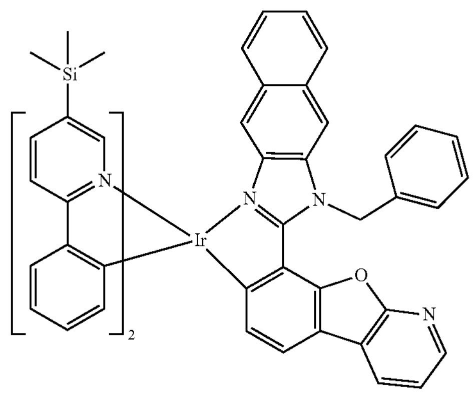

-continued
3113
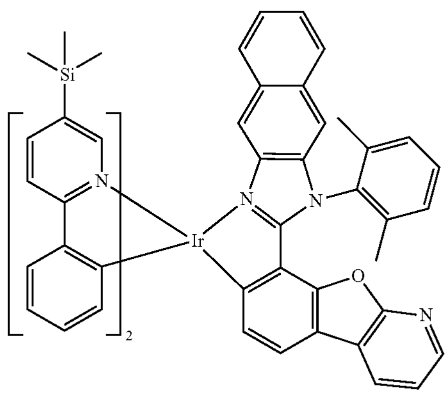
3114
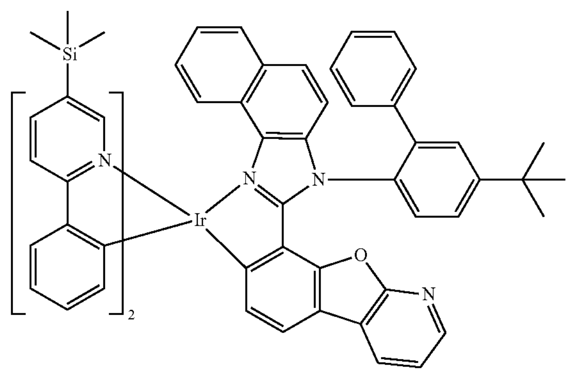
3115
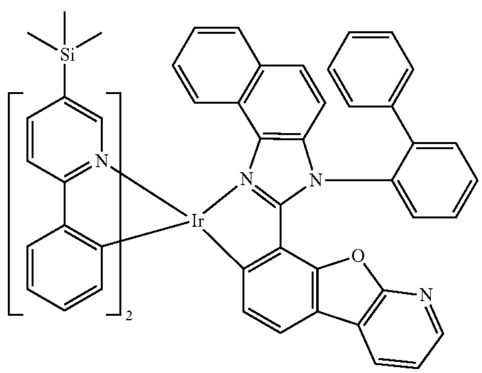
3116
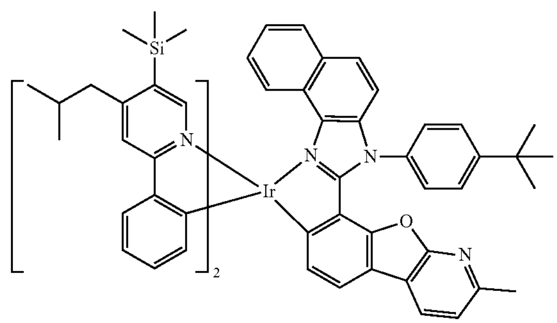
3117
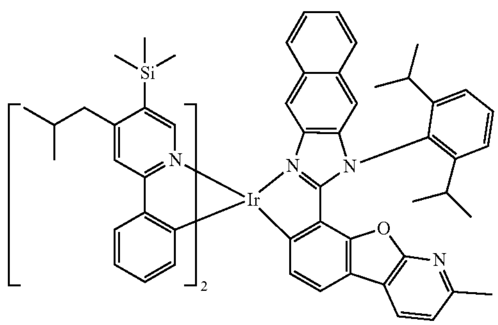
3118
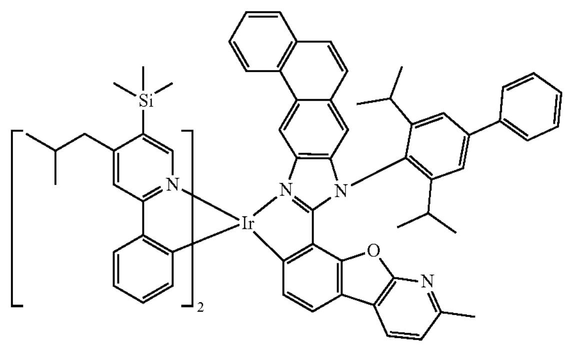
3119
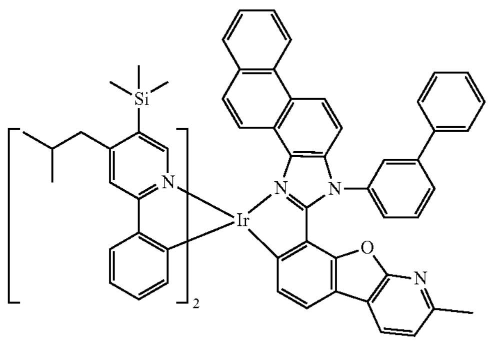
3120
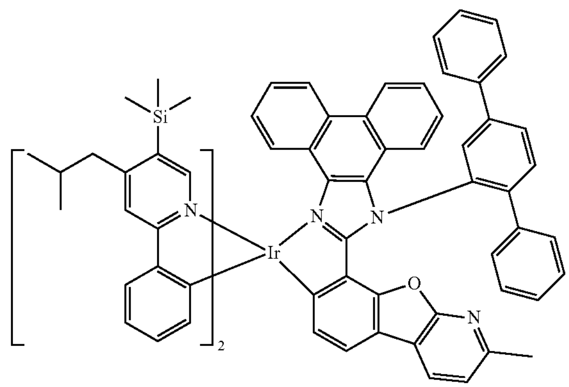

-continued
3121
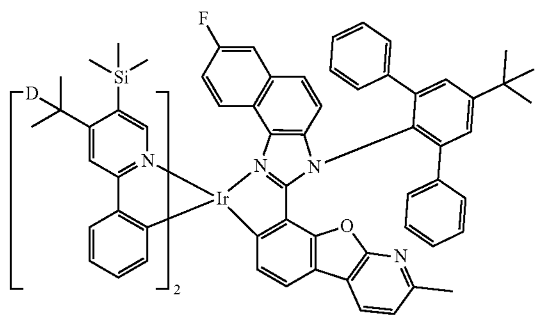
3122
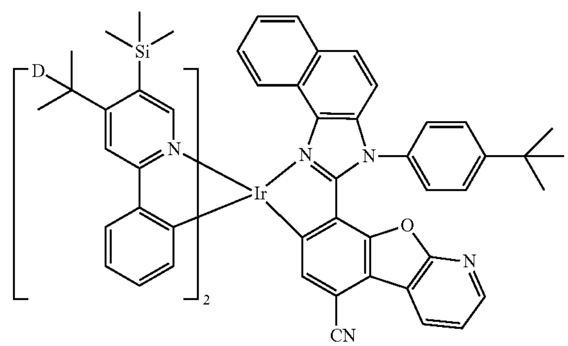
3123
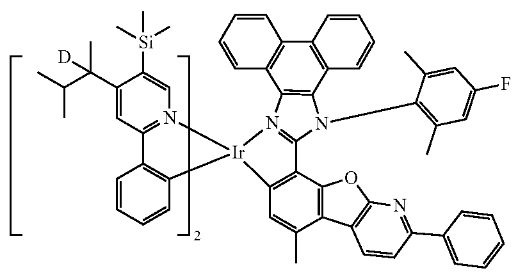
3124
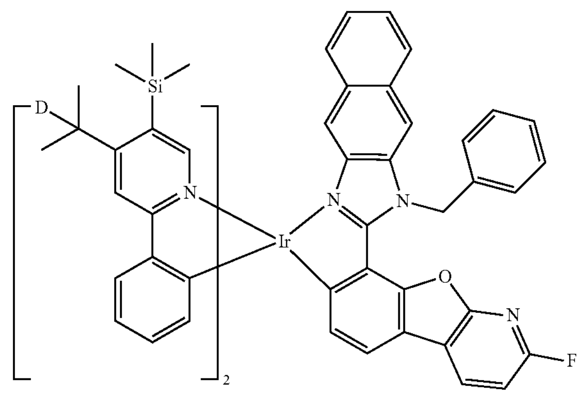
3125
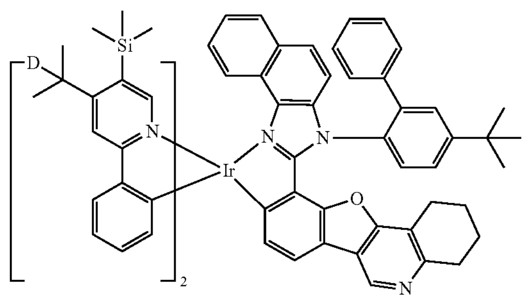
3126
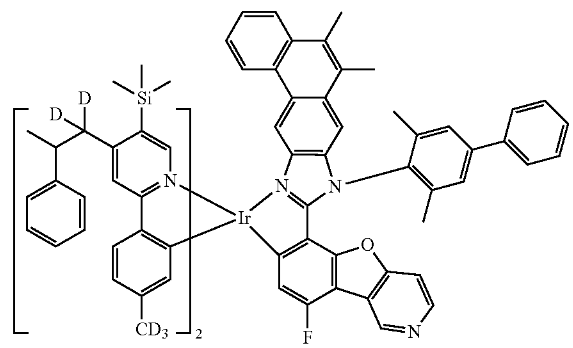
3127
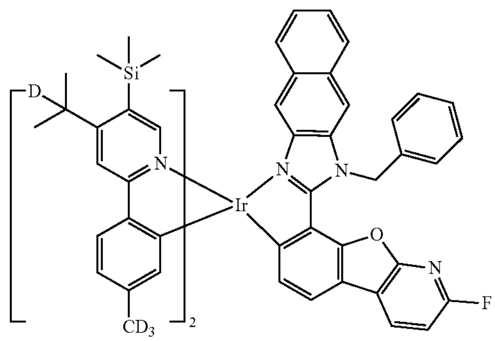
3128
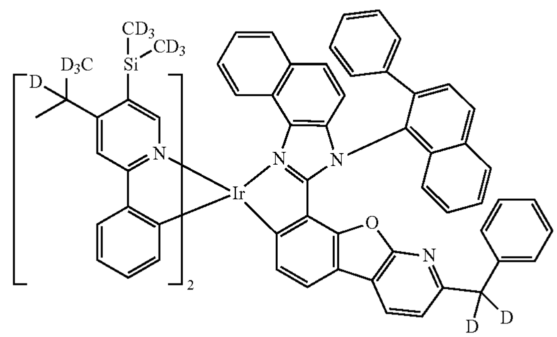

-continued
3129
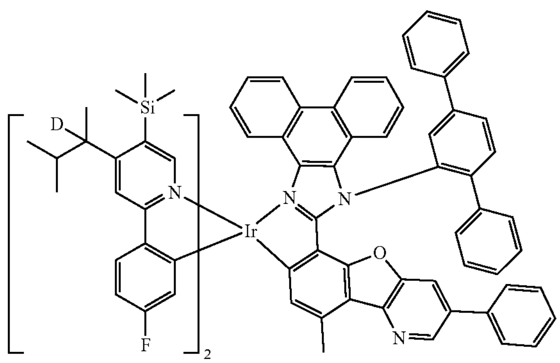
3130
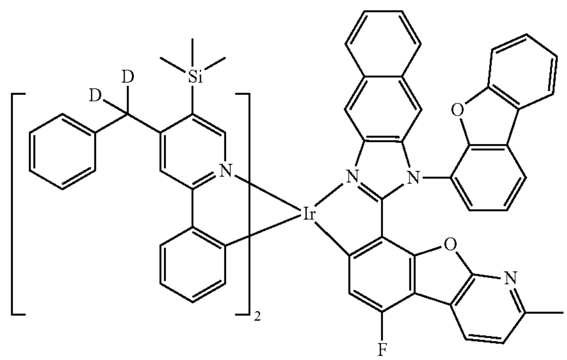
3131
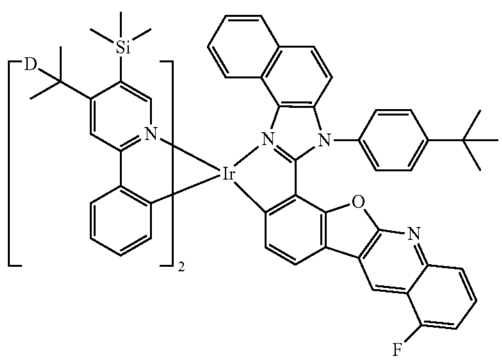
3132
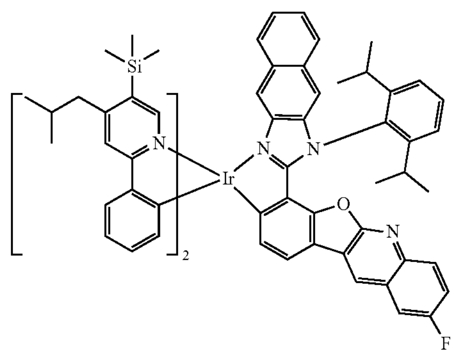
3133
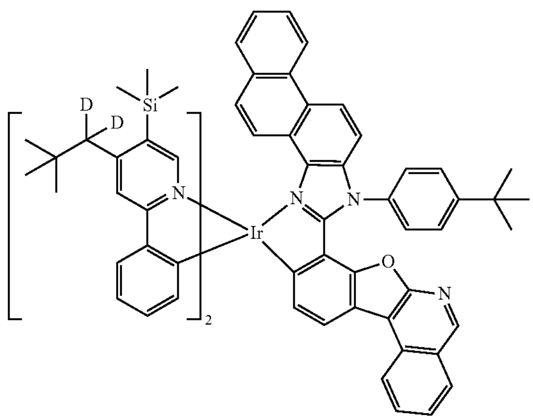
3134
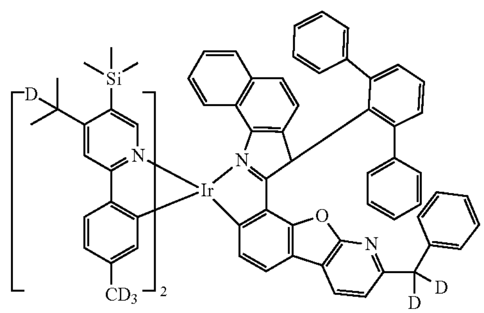
3135
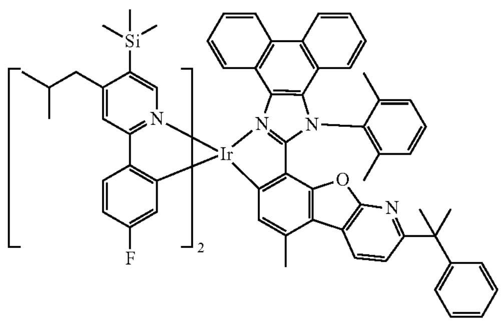
3136
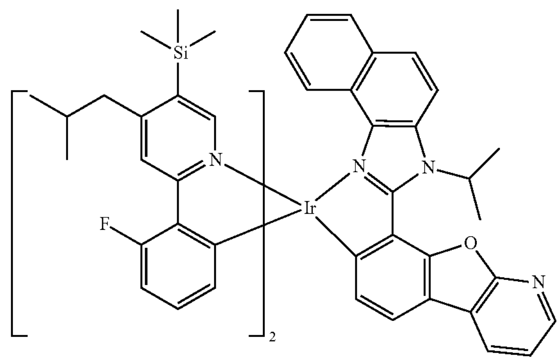

-continued
3137
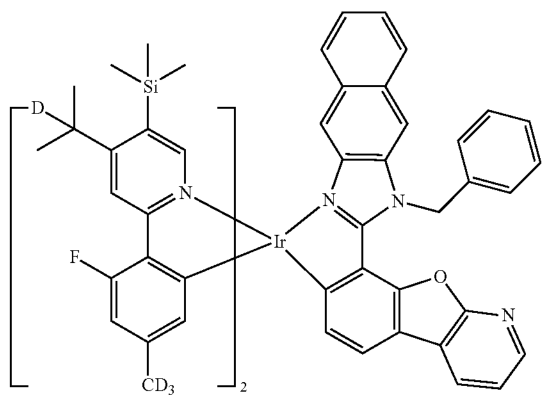
3138
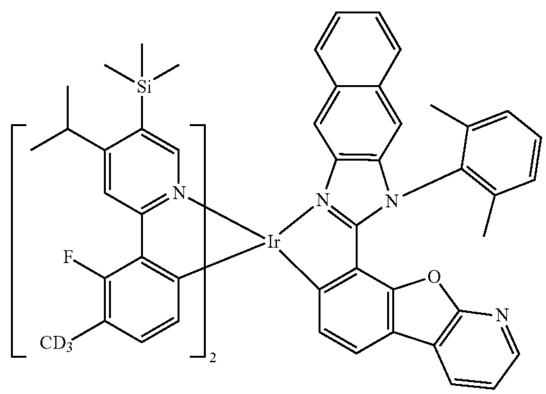
3139
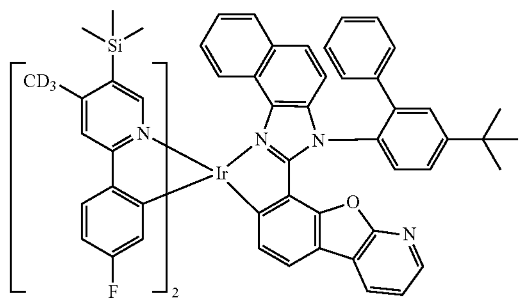
3140
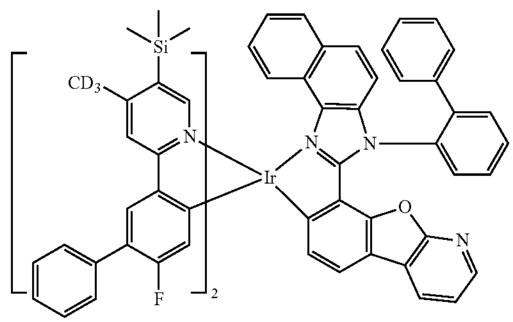
3141
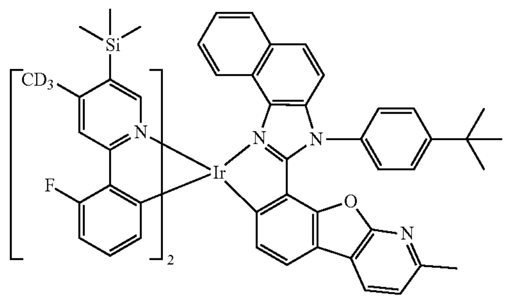
3142
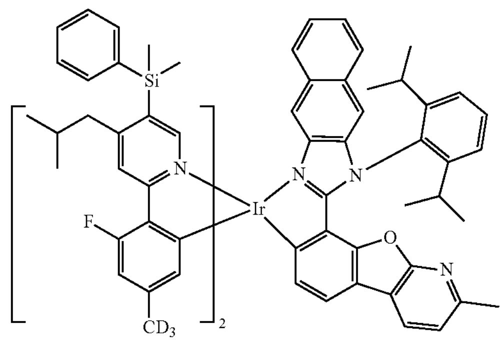
3143
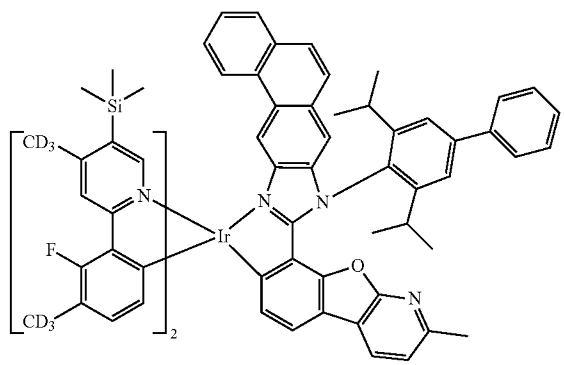
3144
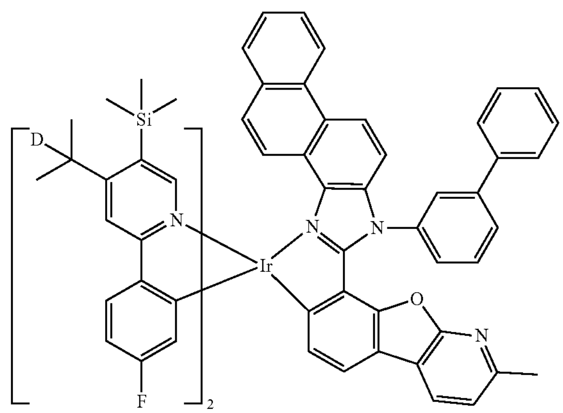

-continued
3145
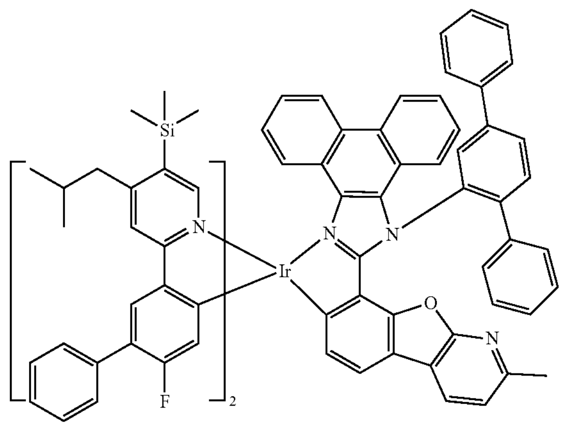
3146
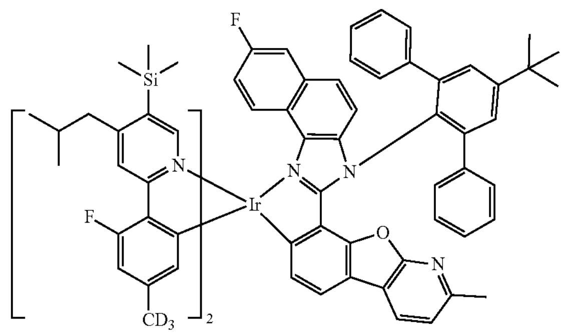
3147
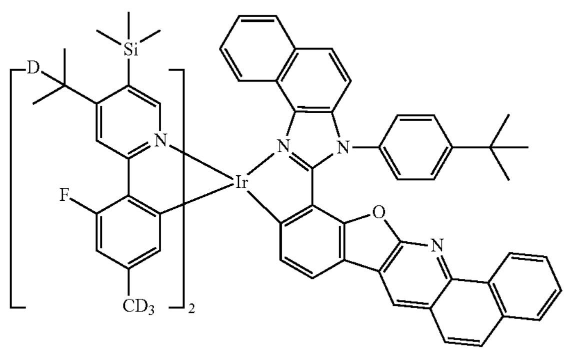
3148
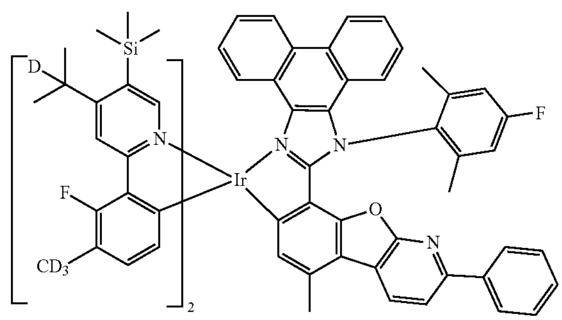
3149
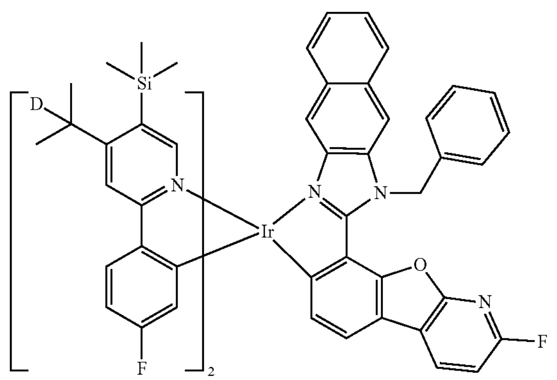
3150
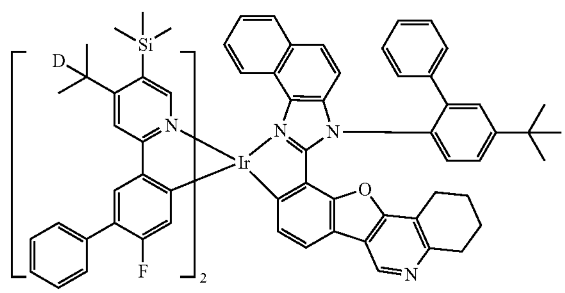
3151
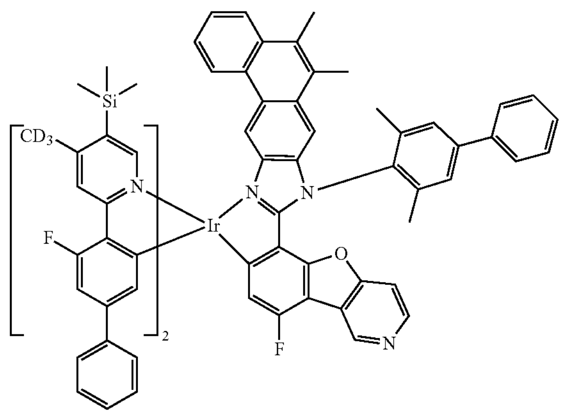
3152
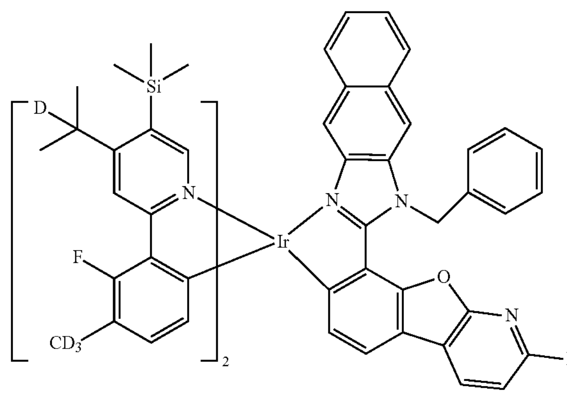

-continued
3153
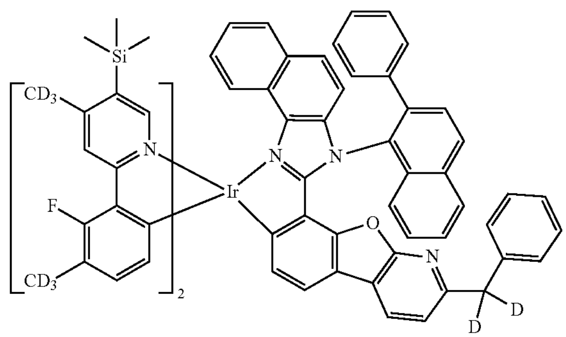
3154
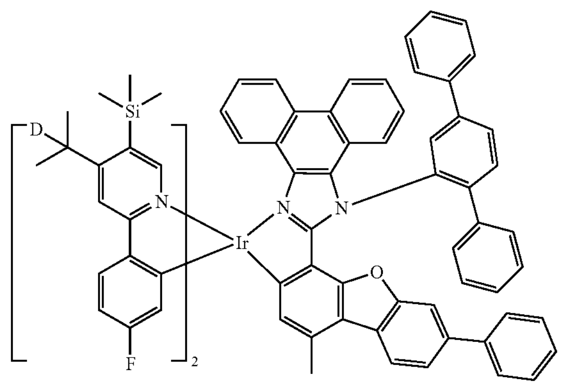
3155
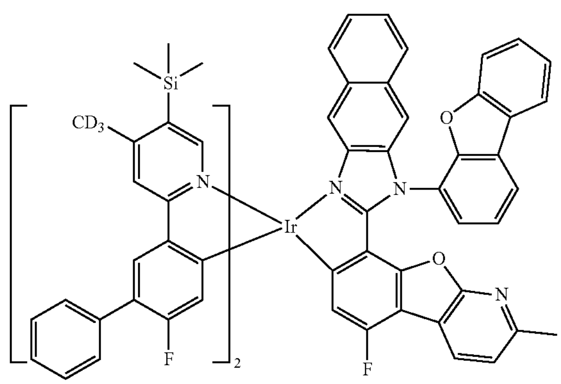
3156
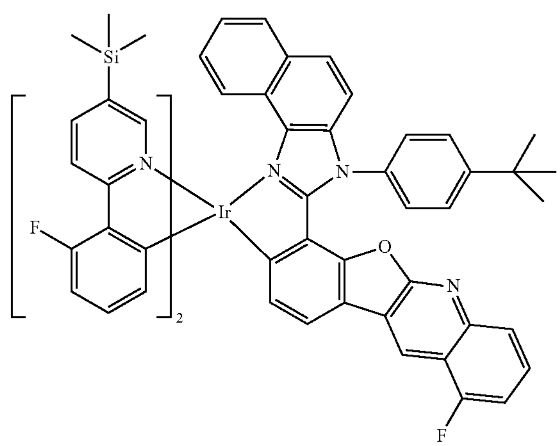
3157
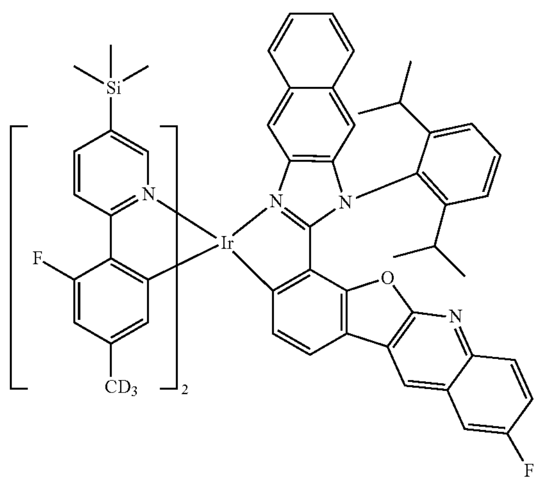
3158
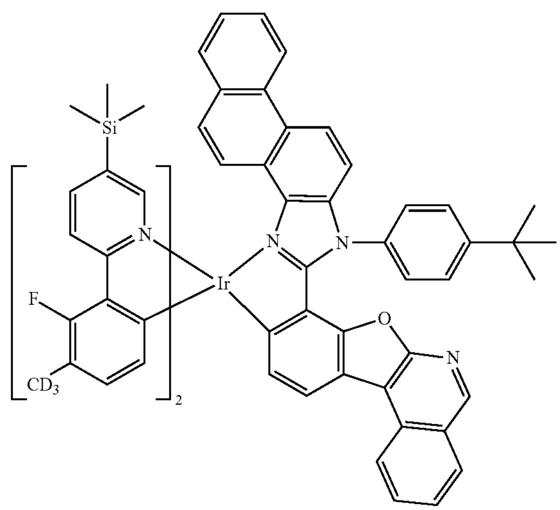

-continued
3159
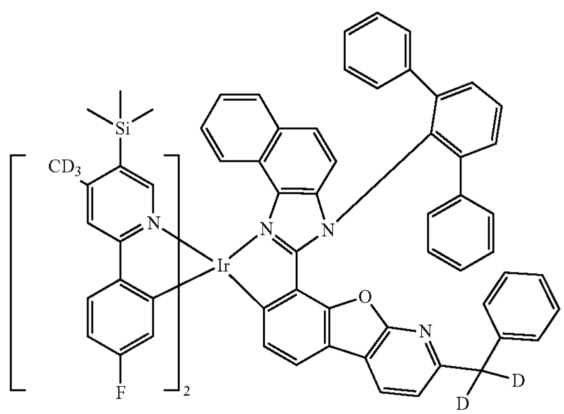
3160
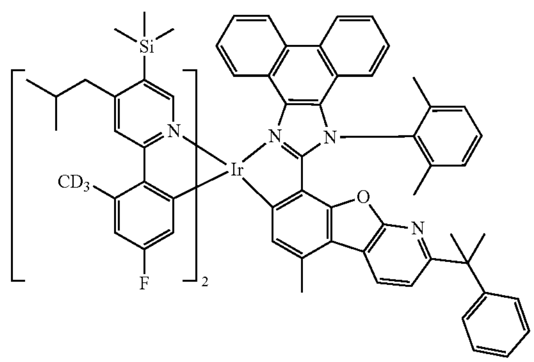
3161
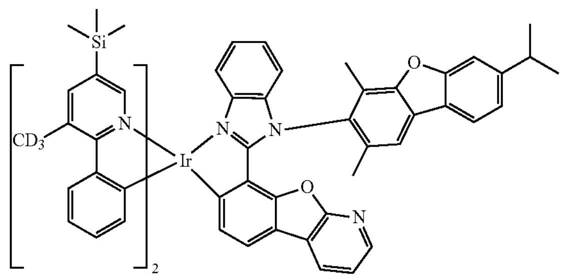
3162
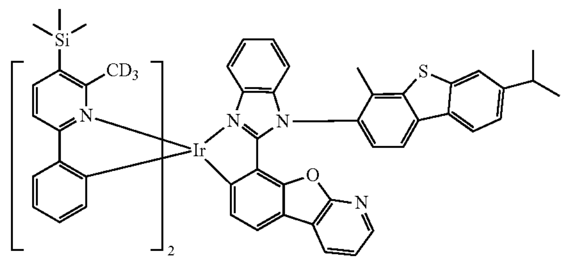
3163
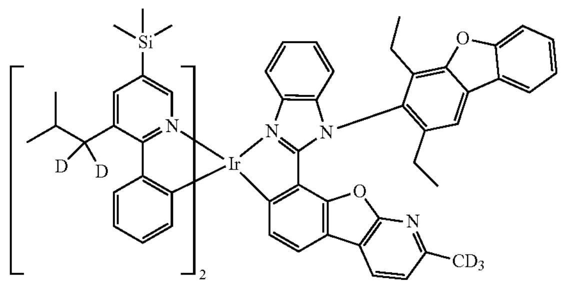
3164
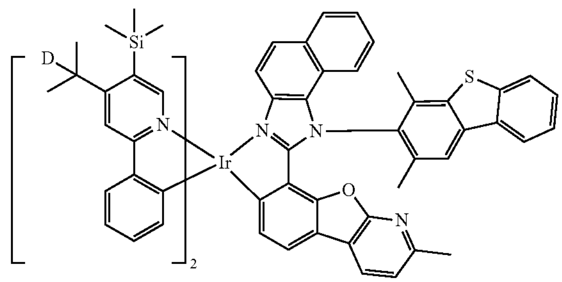
3165
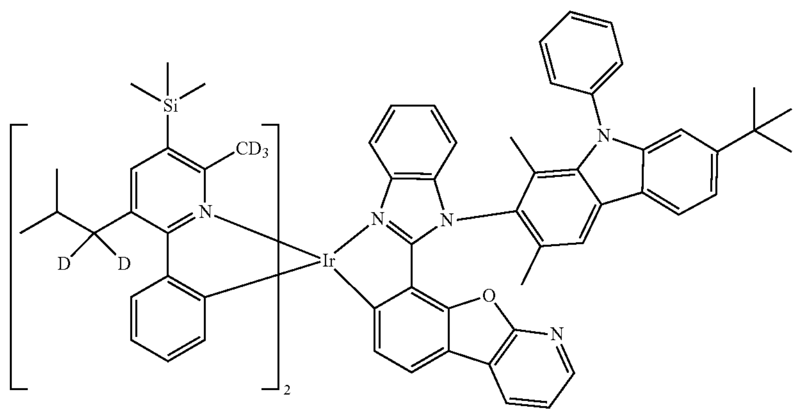

-continued
3166
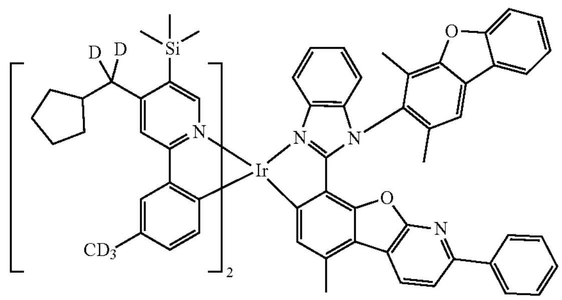
3167
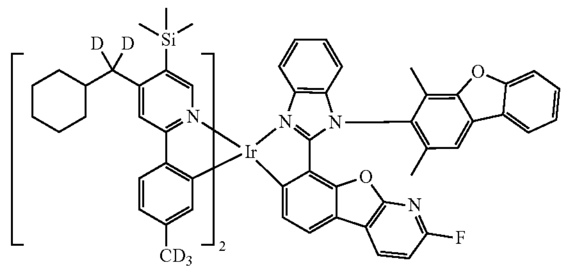
3168
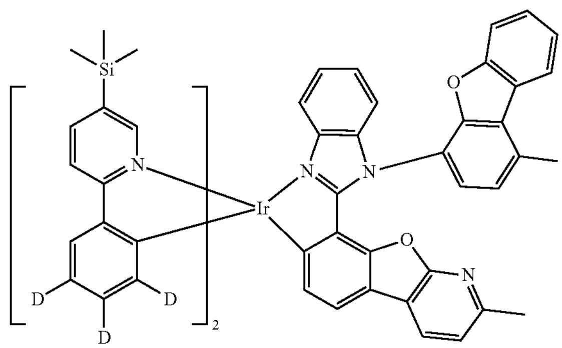
3169
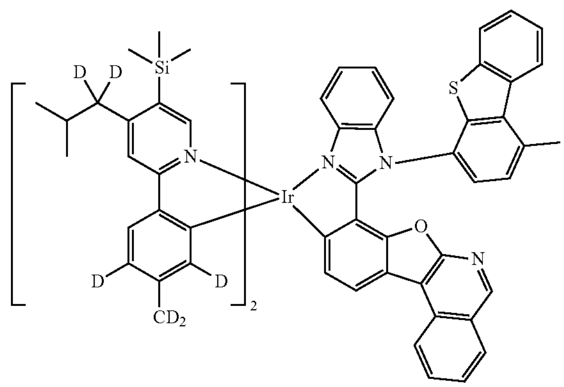
3170
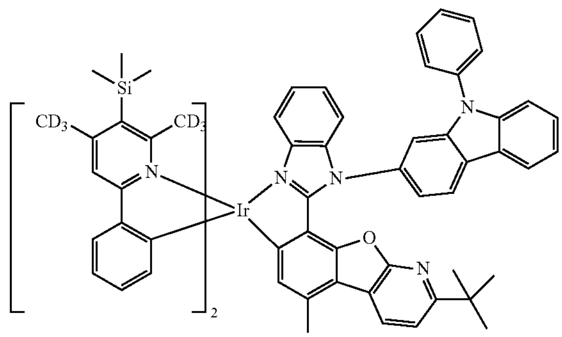
3171
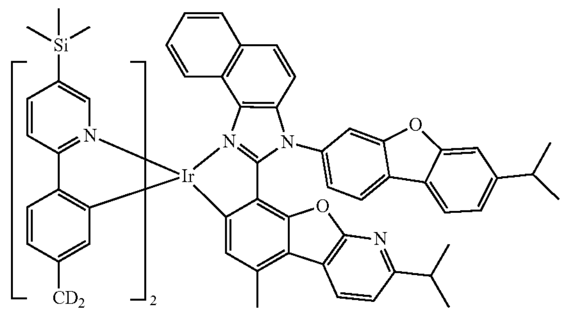
3172
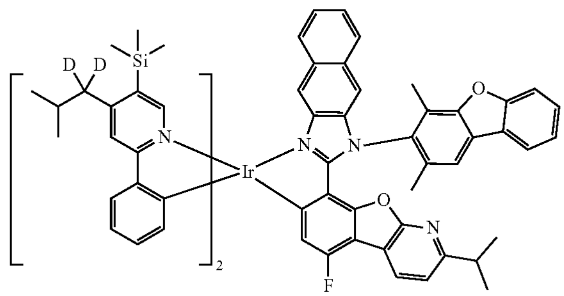
3173
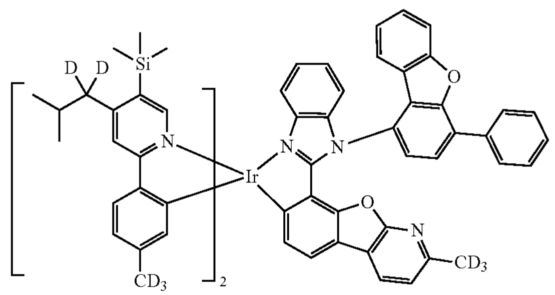

-continued
3174
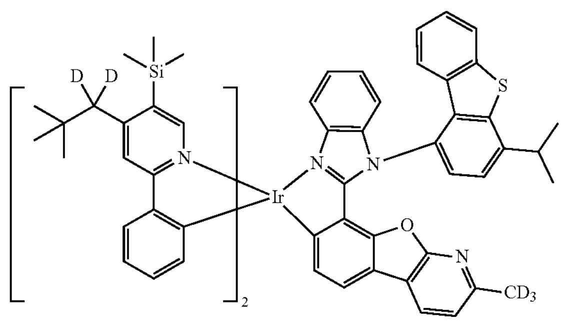
3175
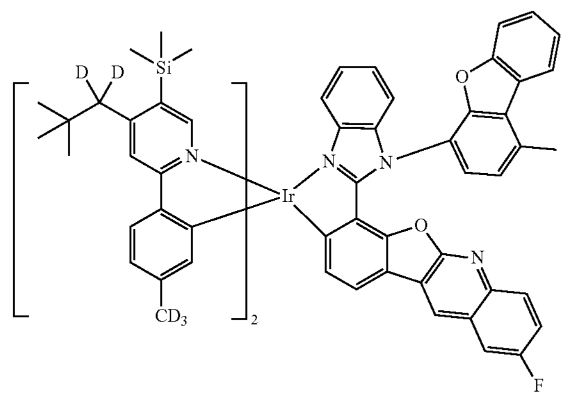
3176
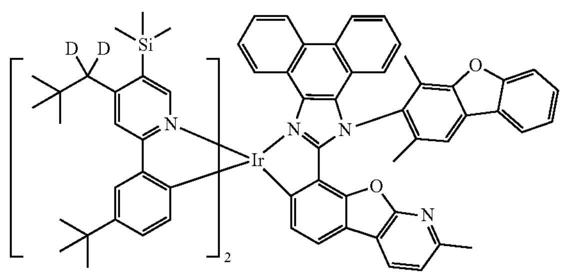
3177
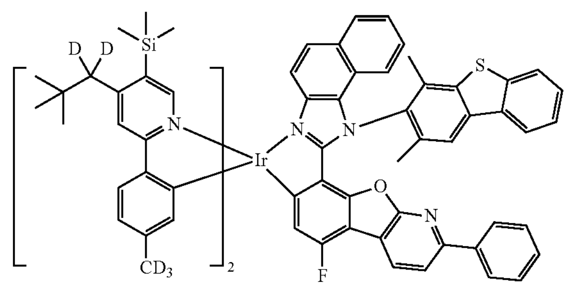
3178
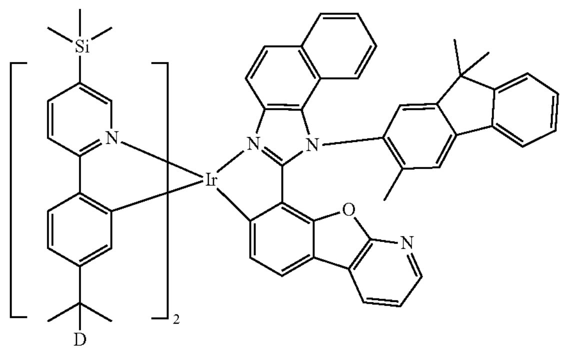
3179
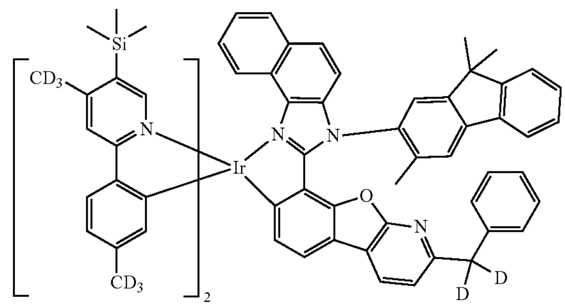
3180
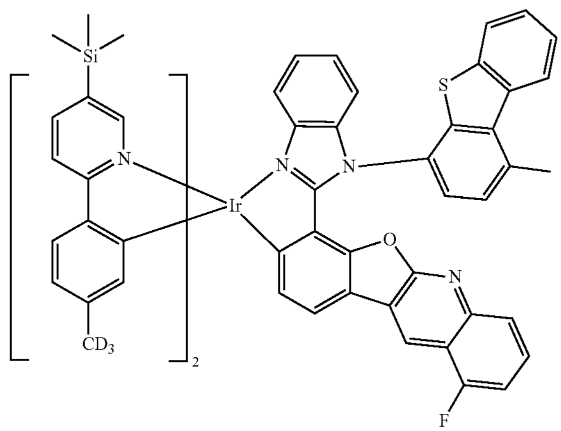
3181
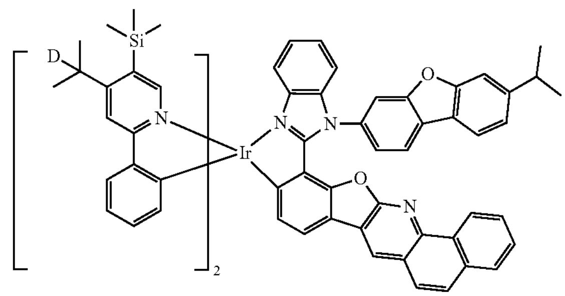

-continued
3182
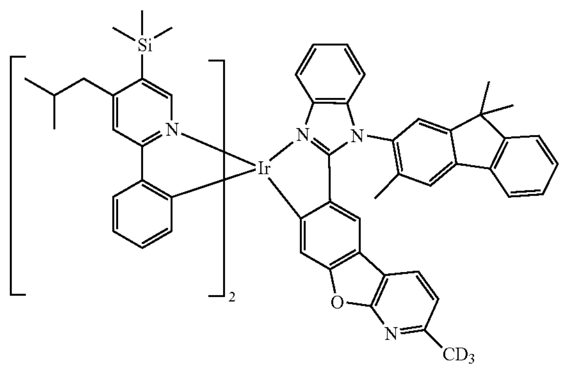
3183
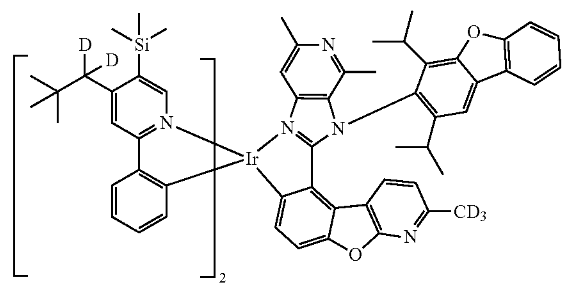
3184
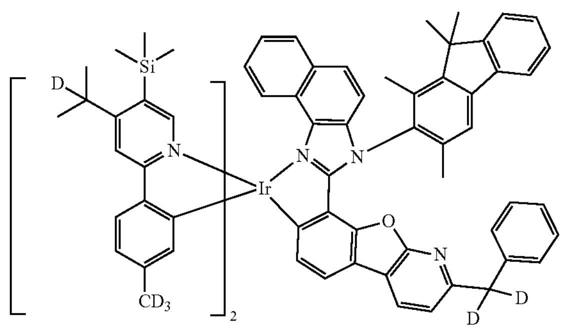
3185
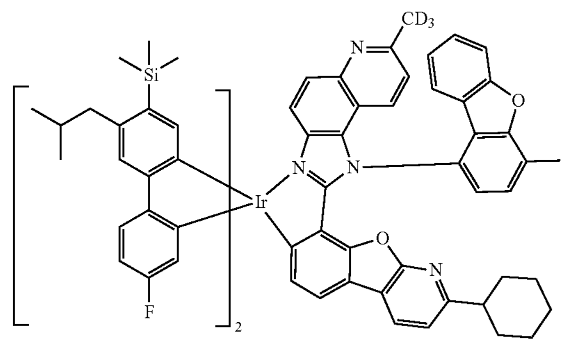
3186
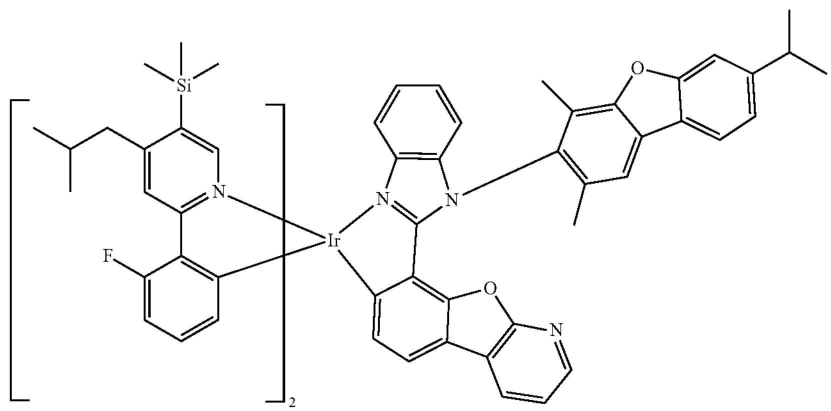
3187
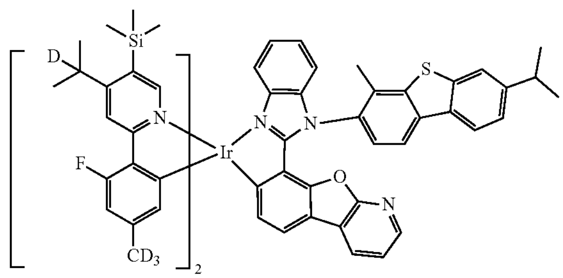
3188
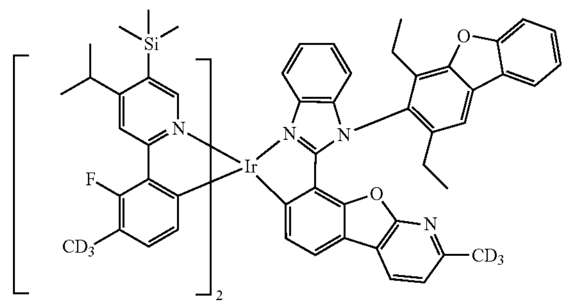

-continued
3189
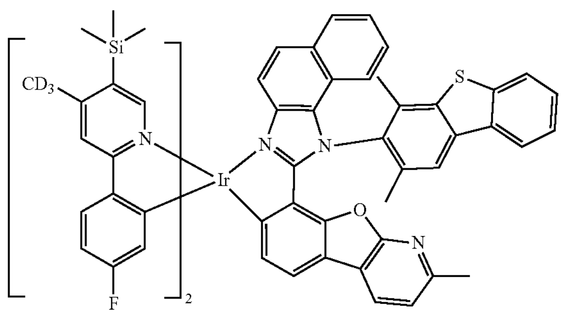
3190
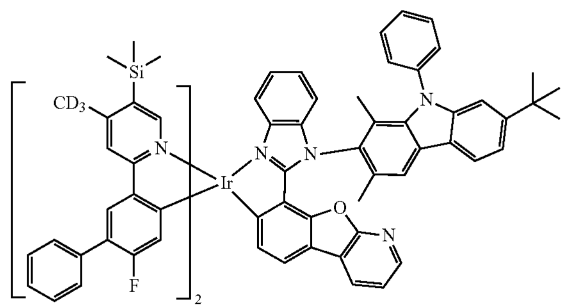
3191
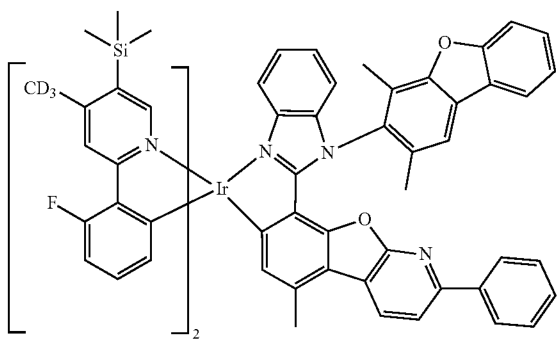
3192
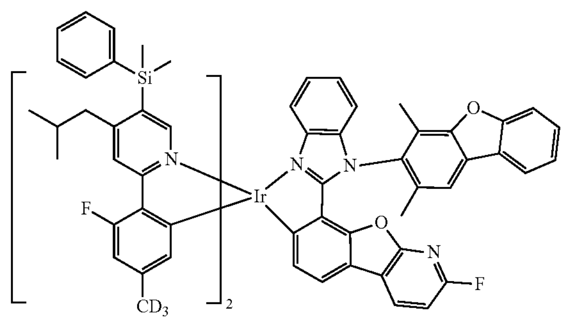
3193
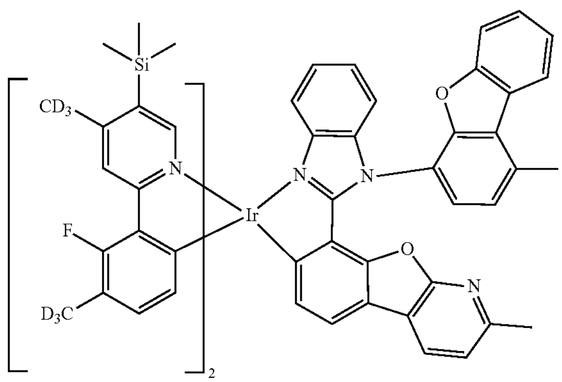
3194
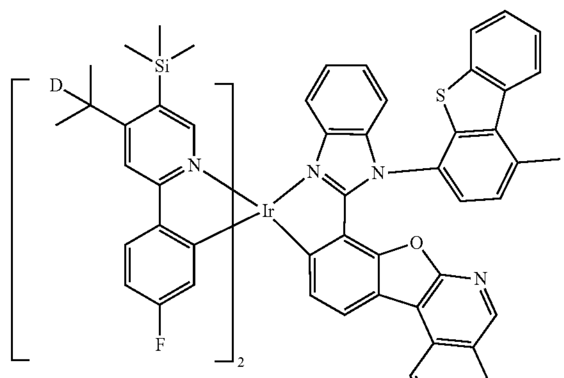
3195
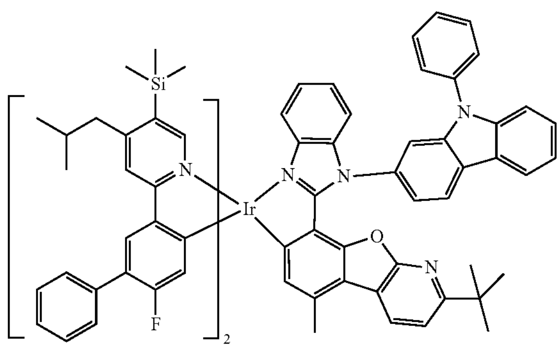
3196
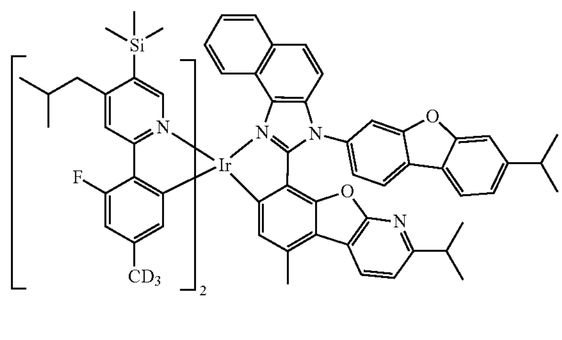

-continued
3197
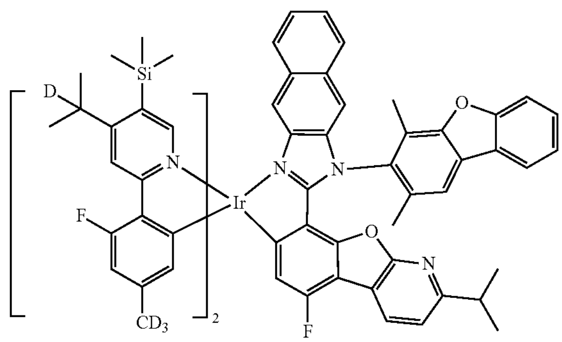
3198
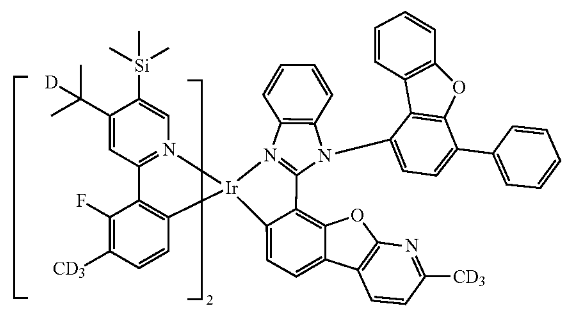
3199
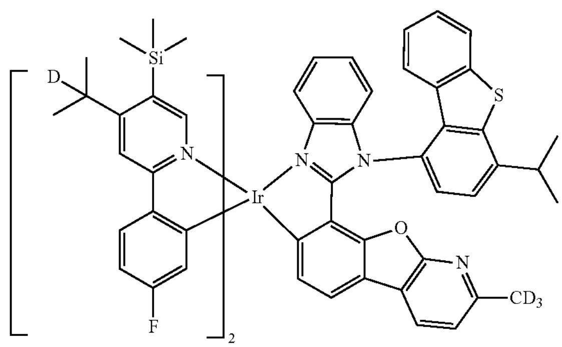
3200
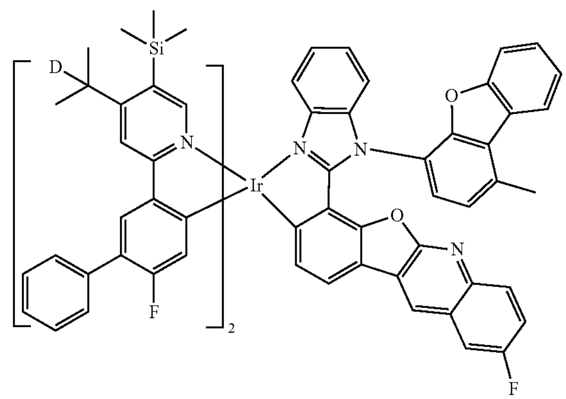
3201
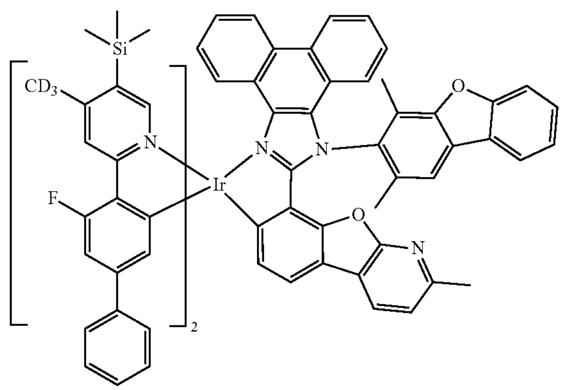
3202
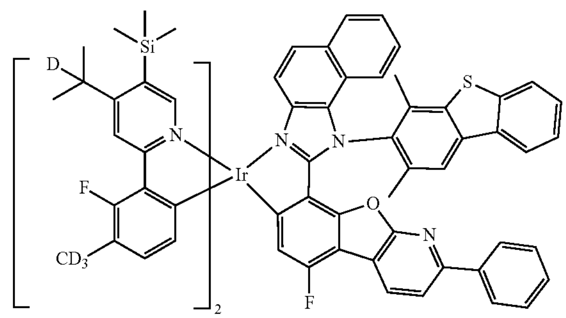
3203
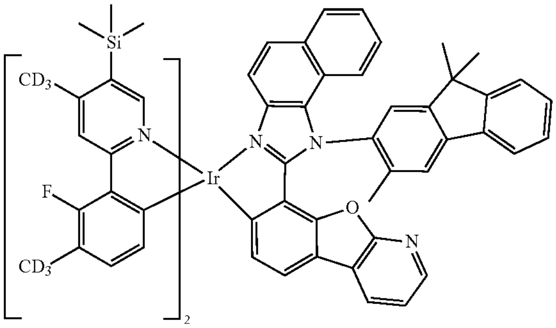
3204
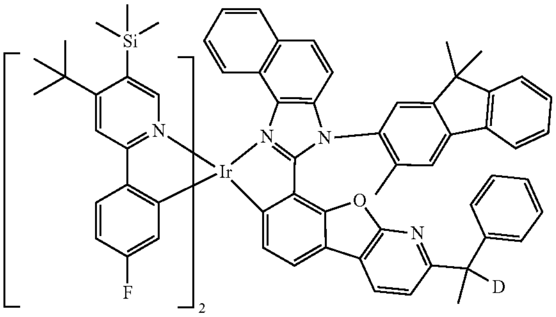

-continued
3205
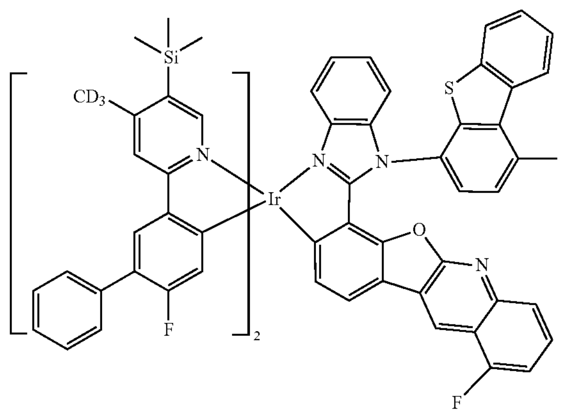
3206
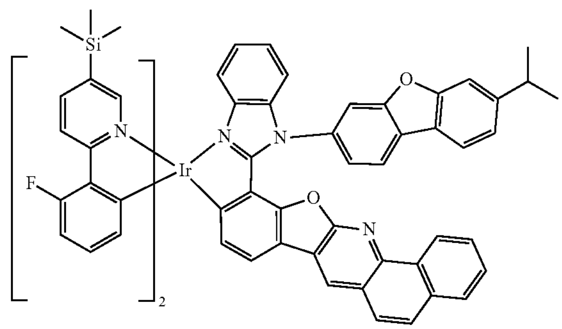
3207
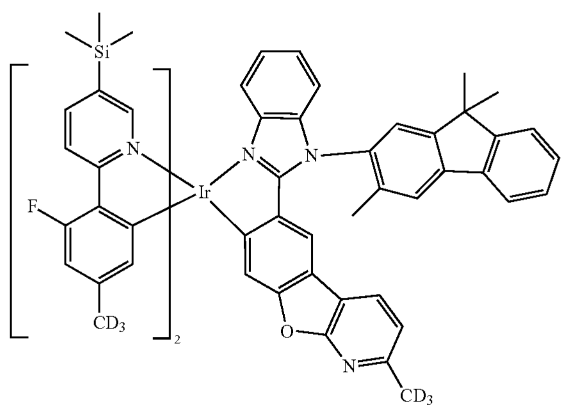
3208
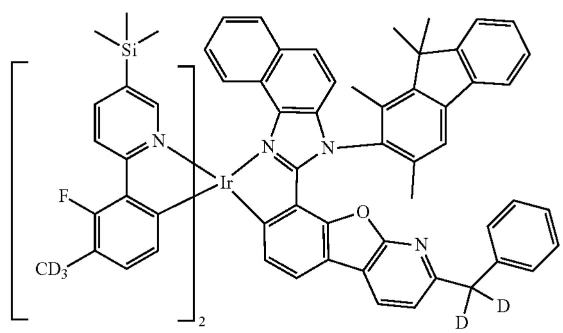
3209
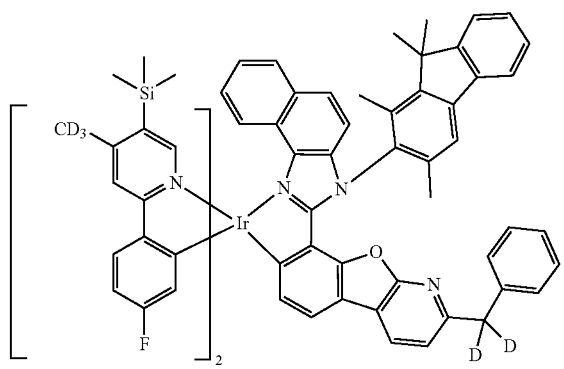
3210
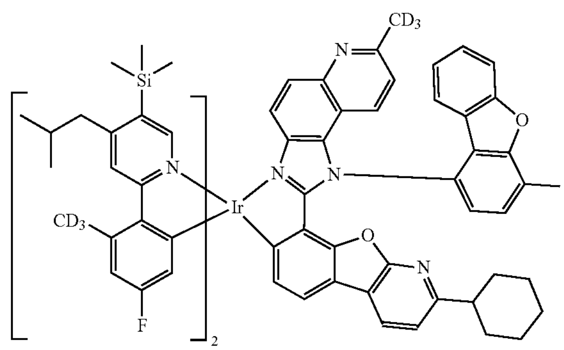
3211
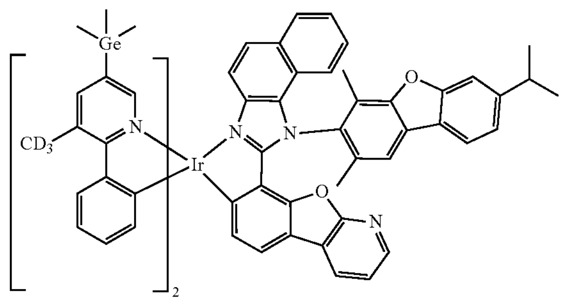
3212
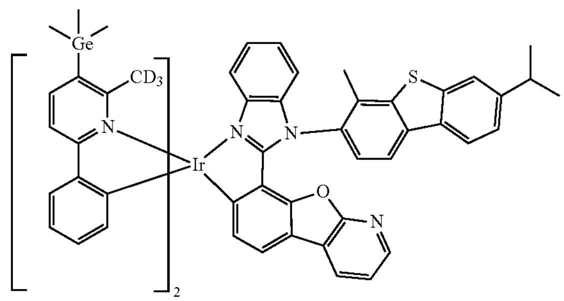

-continued
3213
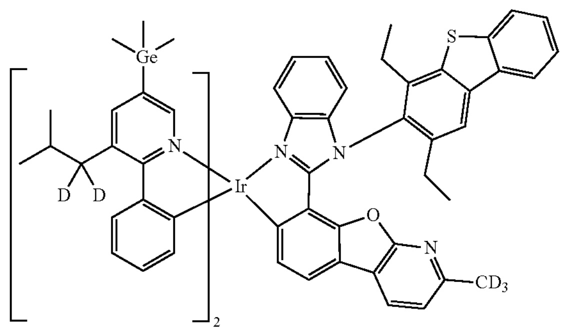
3214
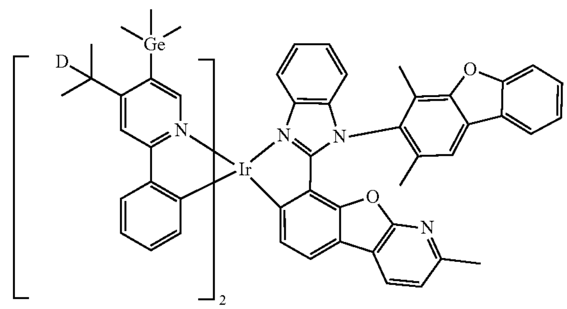
3215
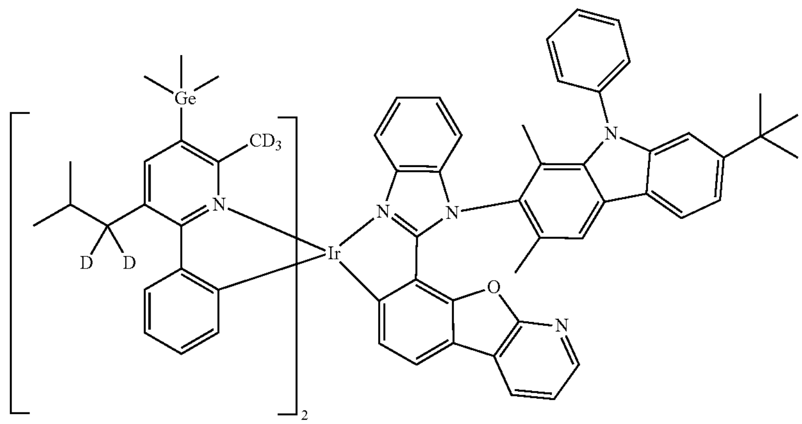
3216
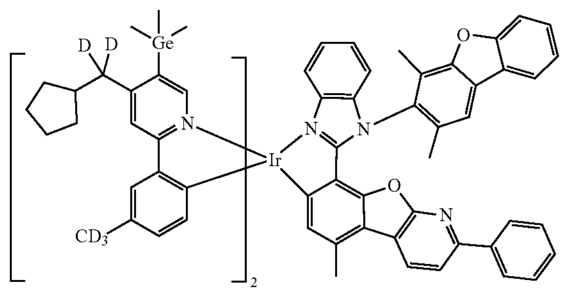
3217
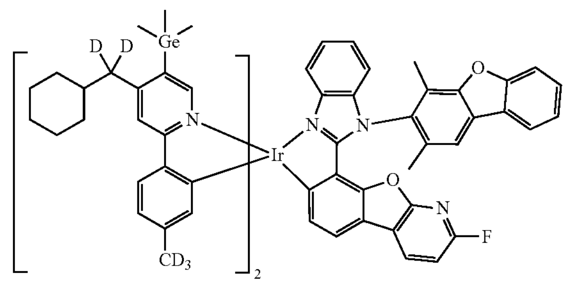
3218
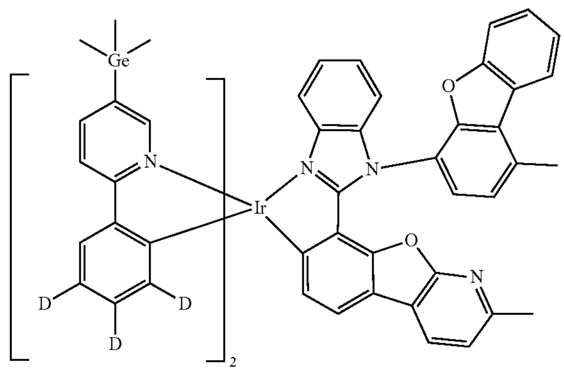
3219
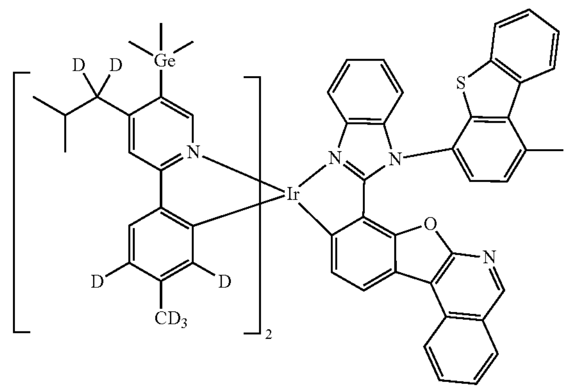

-continued
3220
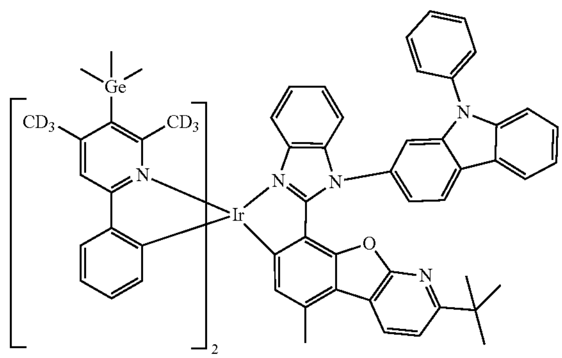
3221
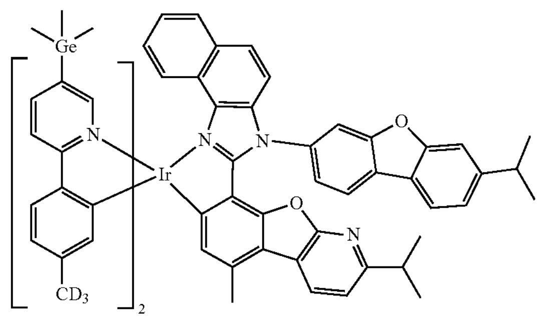
3222
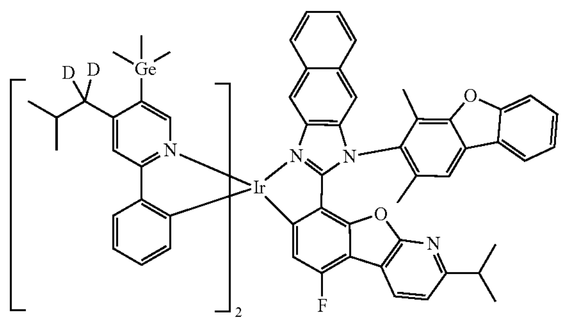
3223
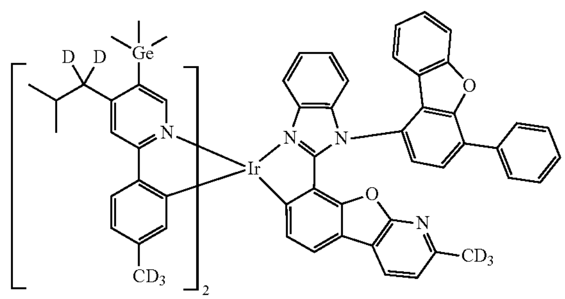
3224
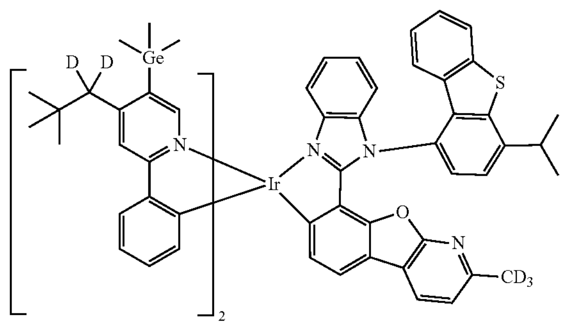
3225
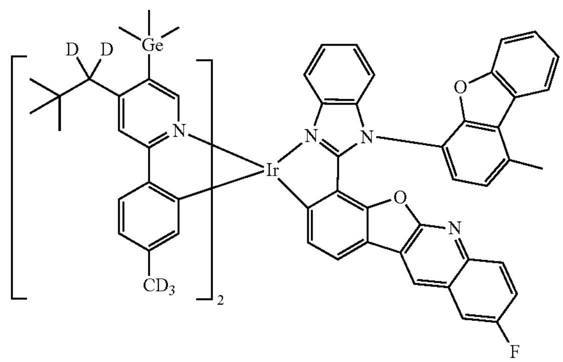
3226
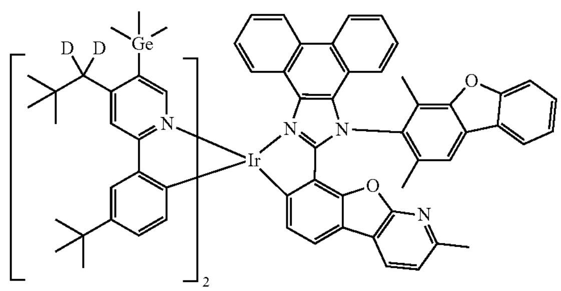
3227
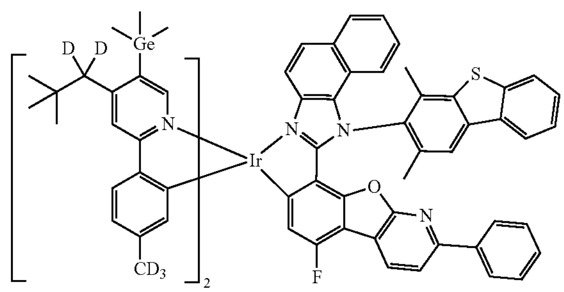

-continued
3228
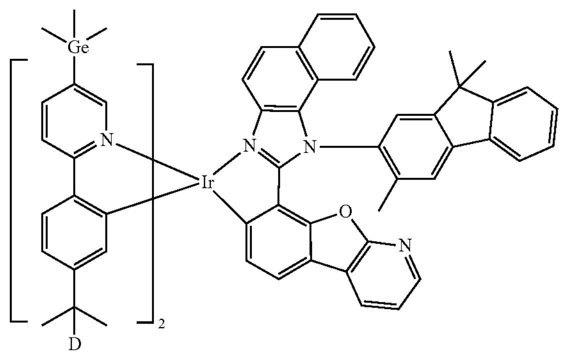
3229
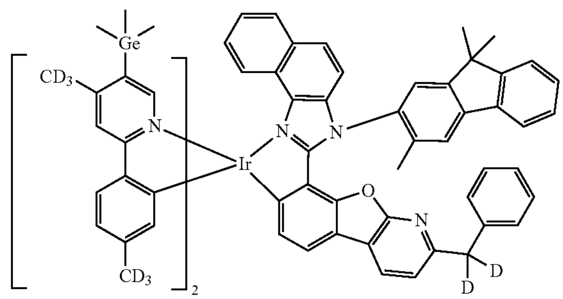
3230
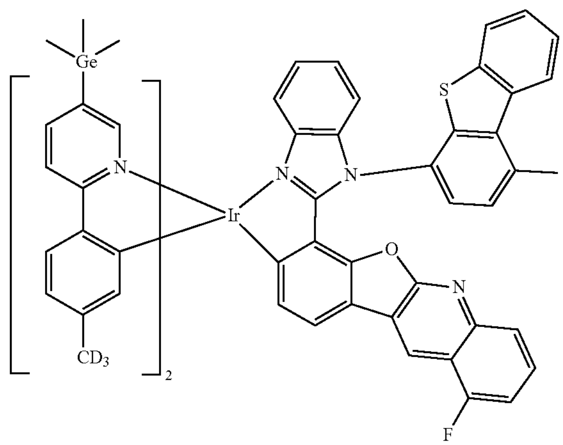
3231
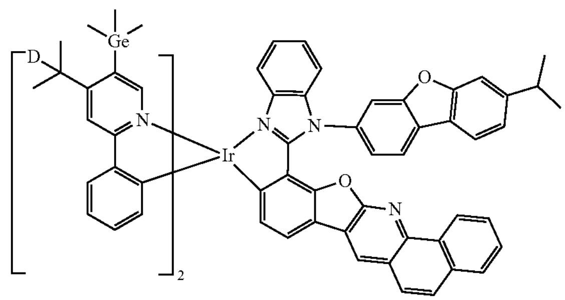
3232
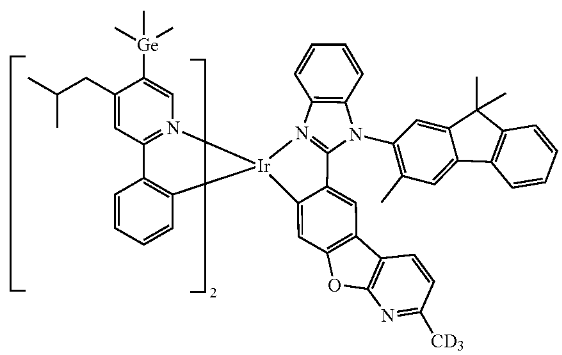
3233
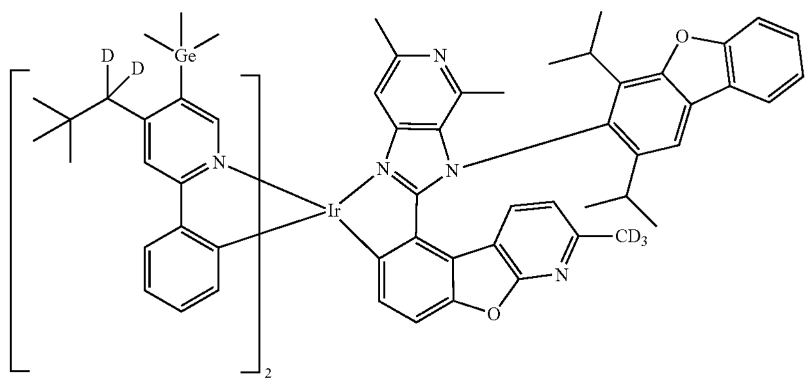

-continued
3234
3235
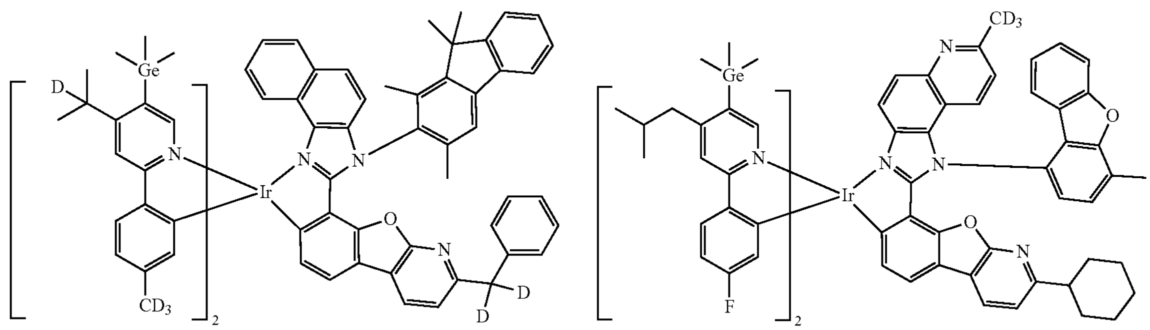
3236
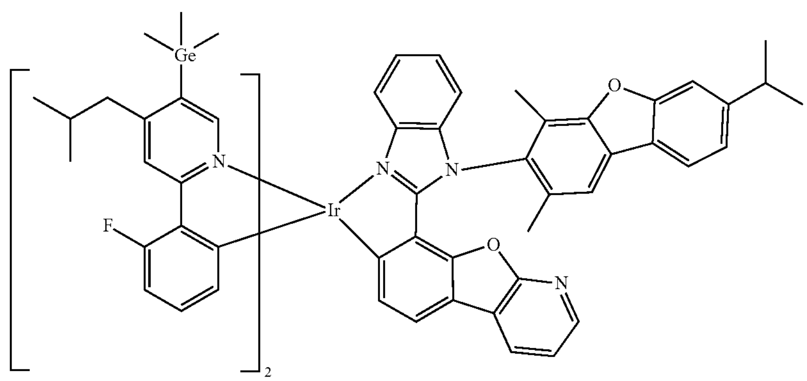
3237
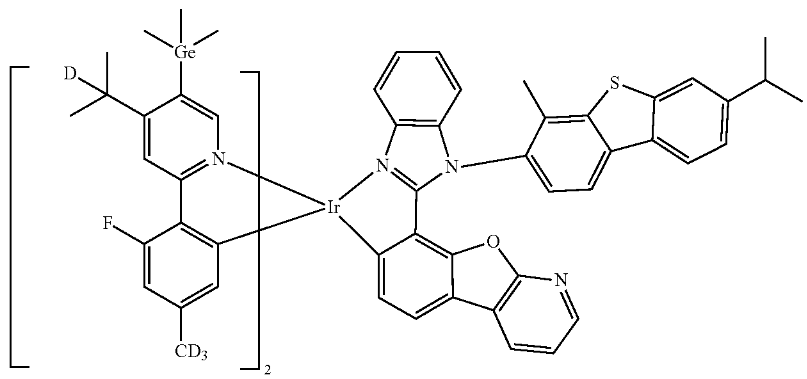
3238
3239
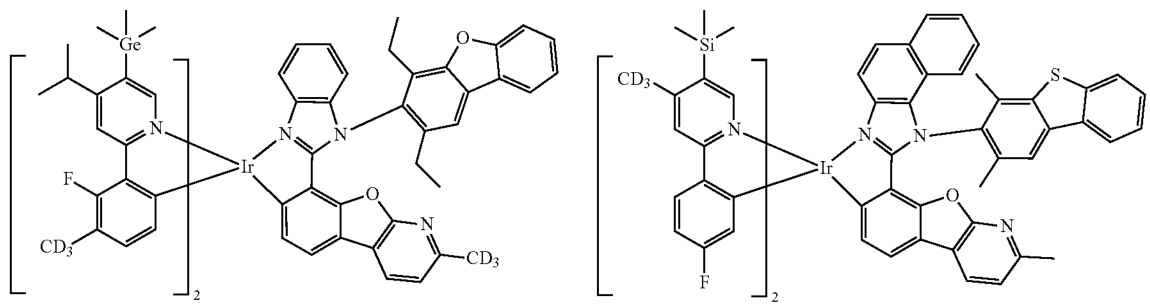

-continued
3240
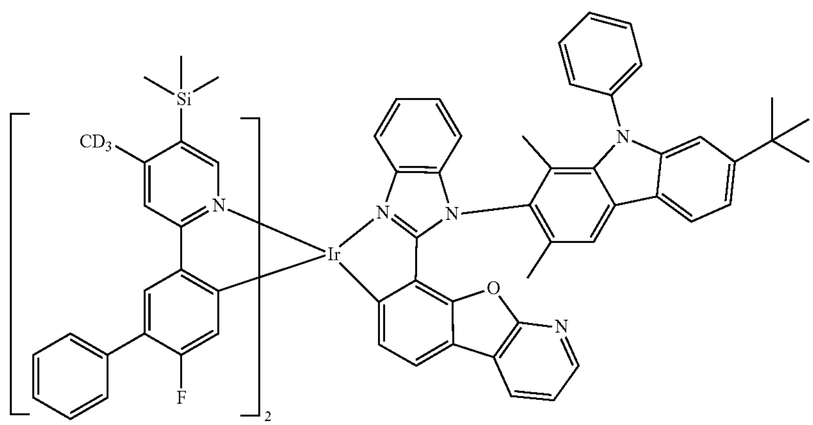
3241
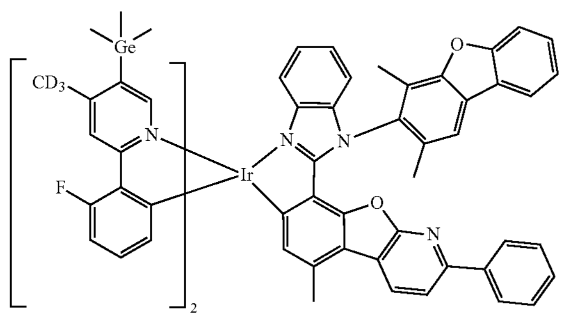
3242
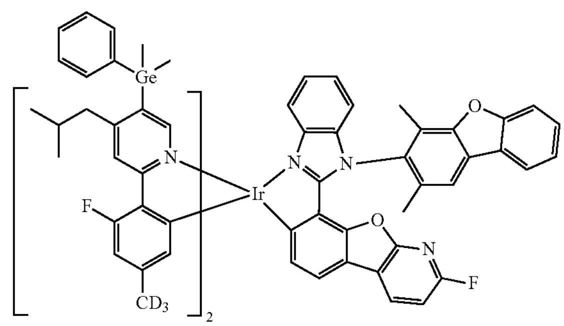
3243
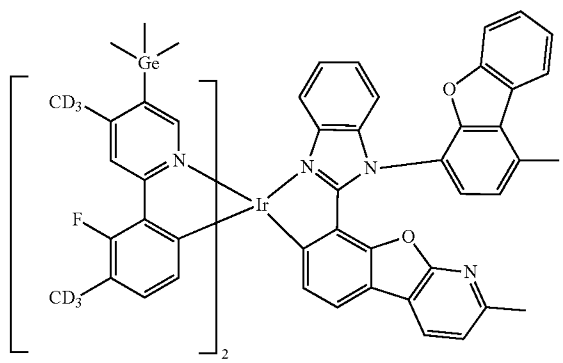
3244
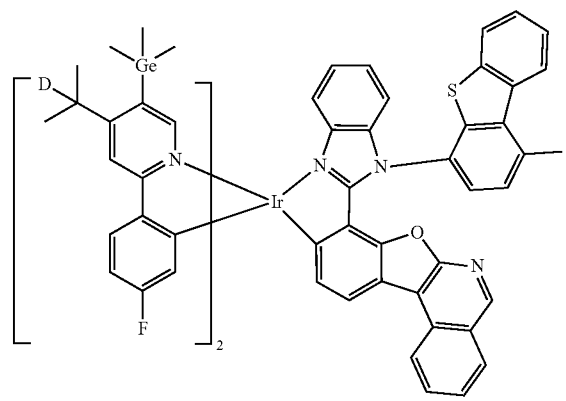
3245
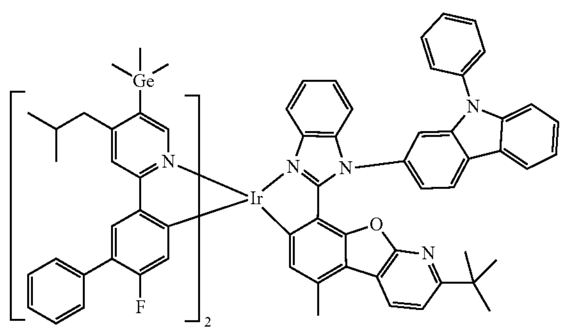
3246
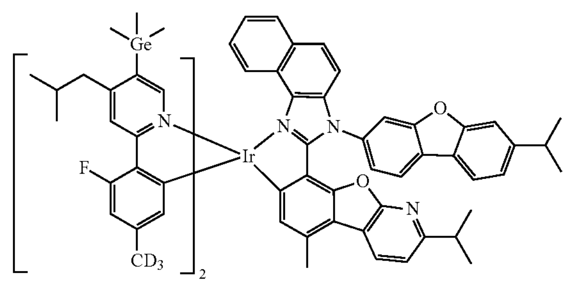

-continued
3247
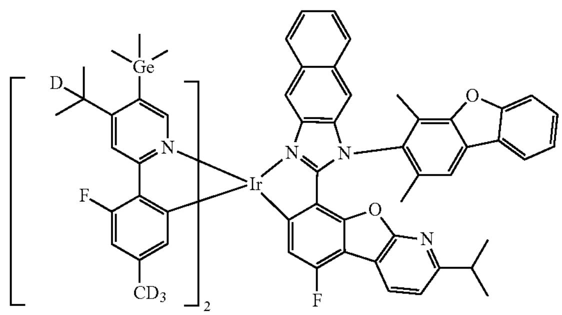
3248
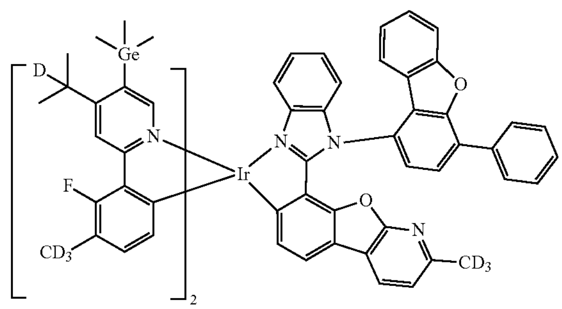
3249
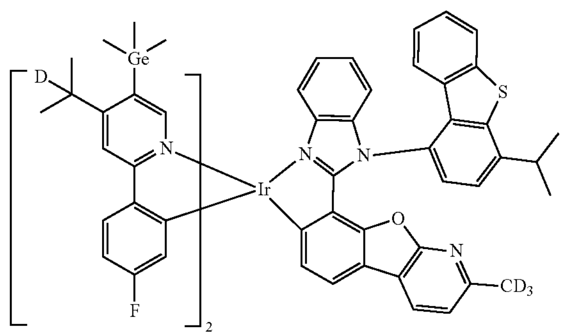
3250
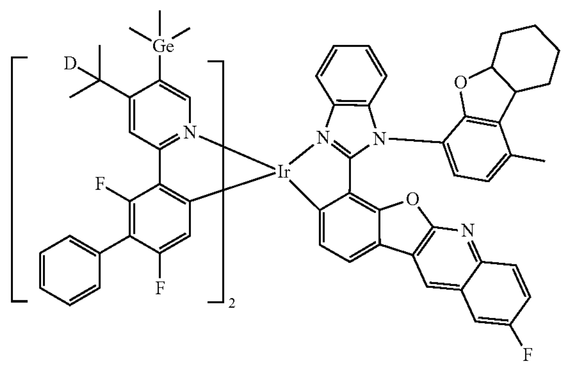
3251
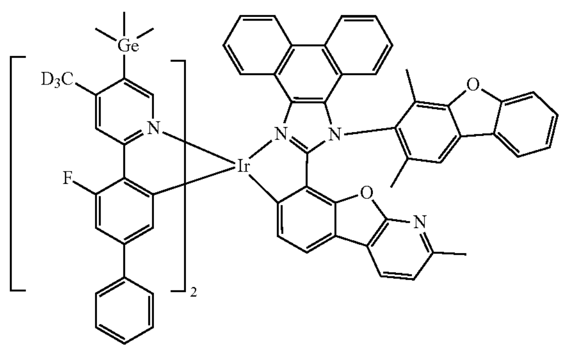
3252
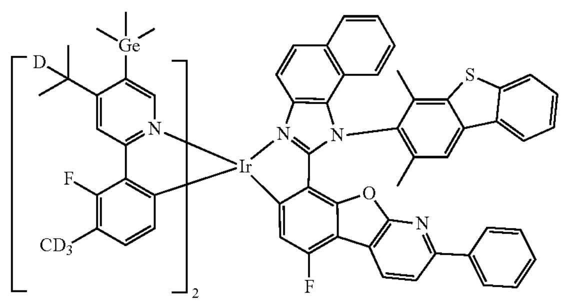
3253
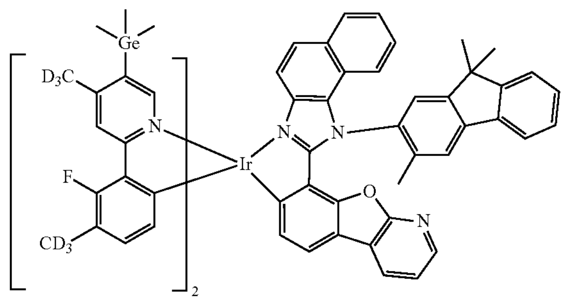
3254
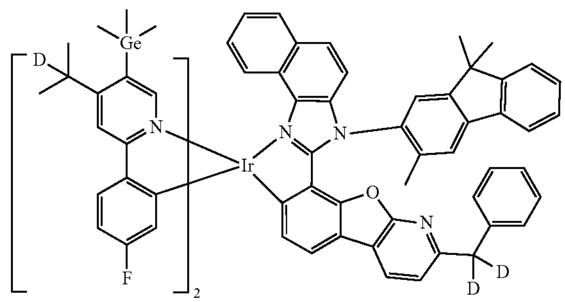

-continued
3255
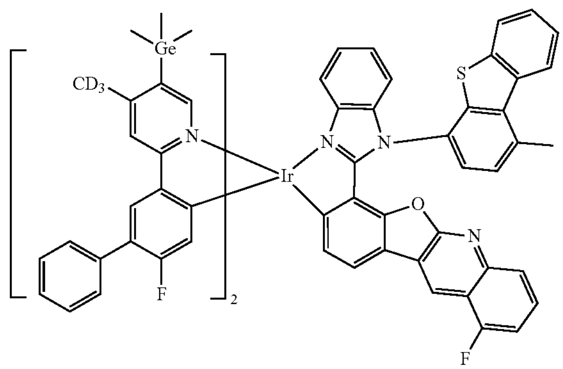
3256
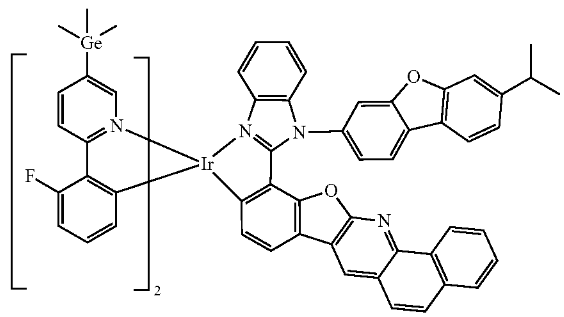
3257
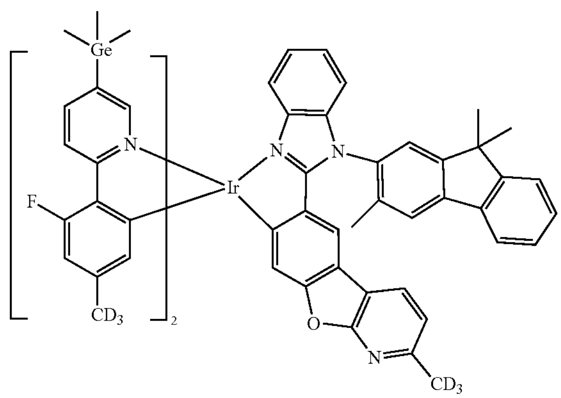
3258
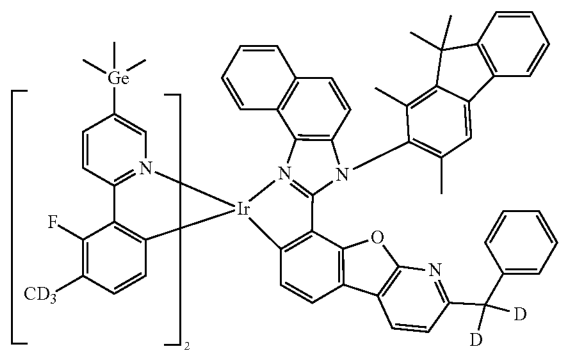
3259
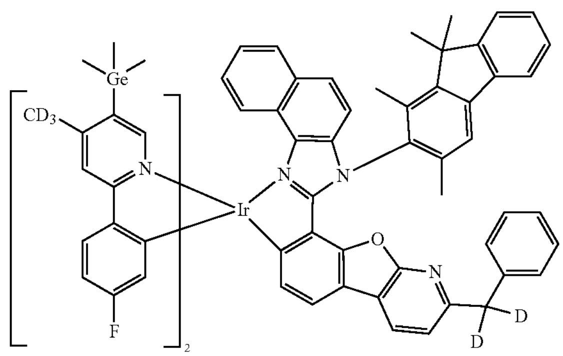
3260
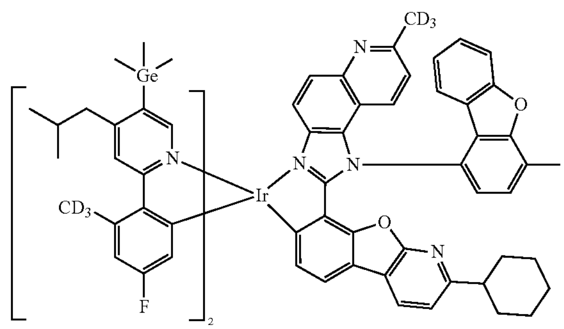
3261
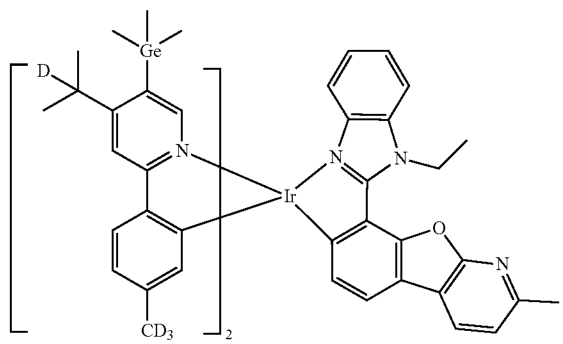
3262
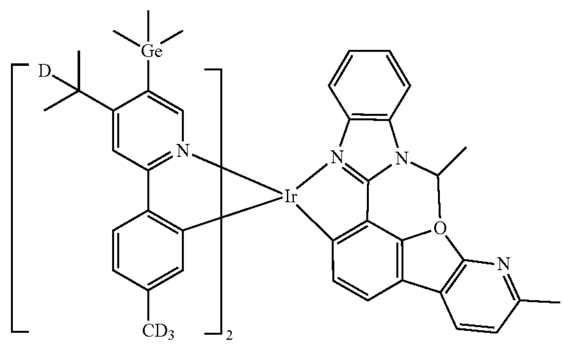

-continued
3263
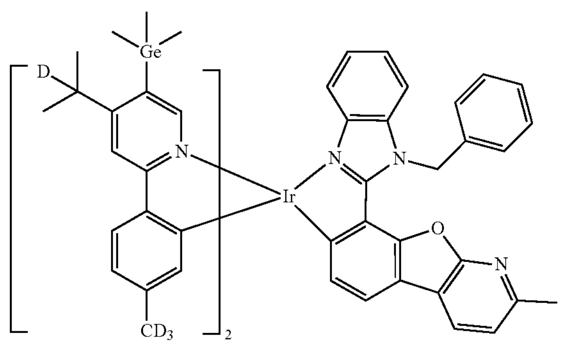
3264
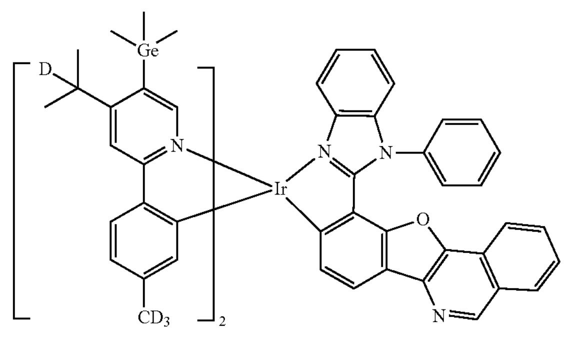
3265
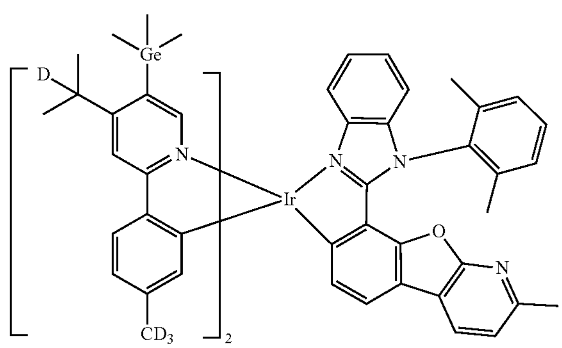
3266
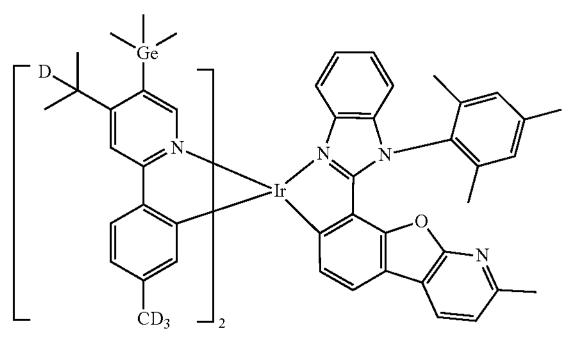
3267
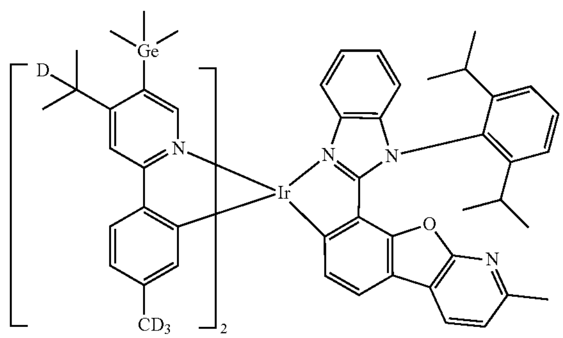
3268
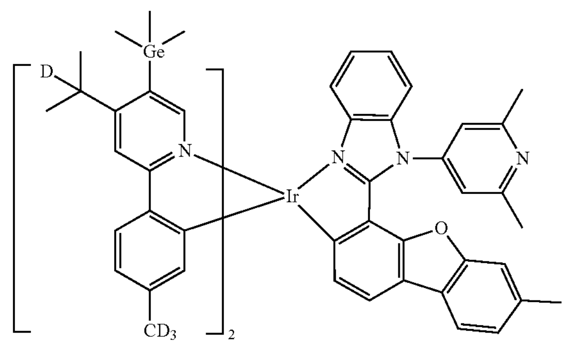
3269
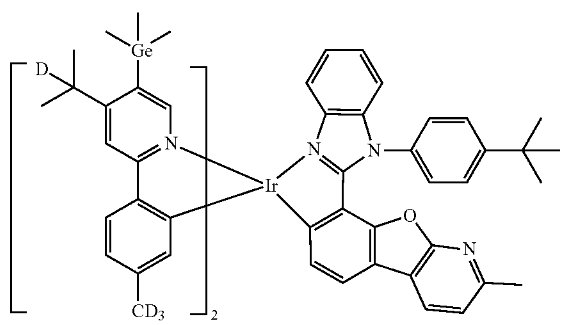
3270
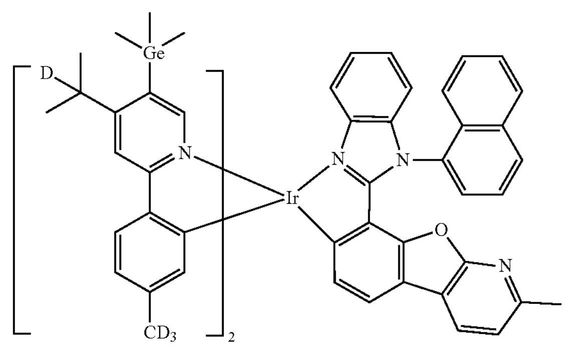

-continued
3271
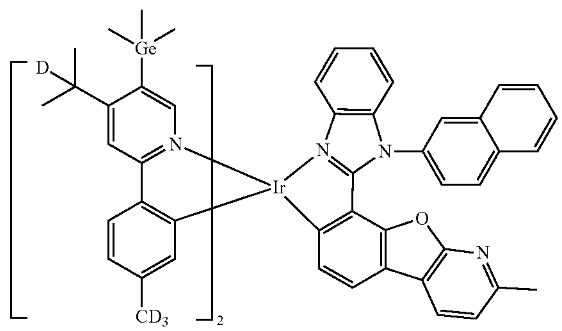
3272
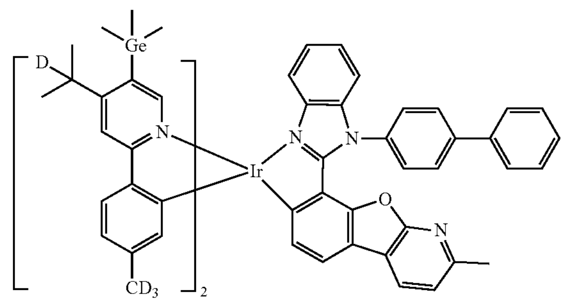
3273
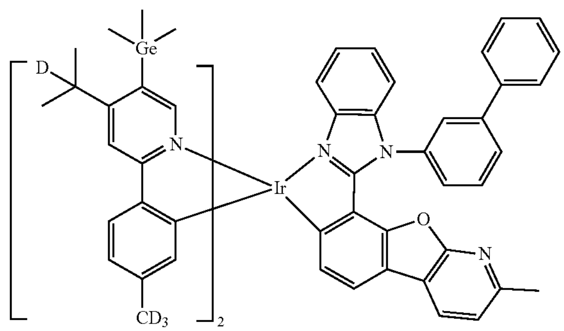
3274
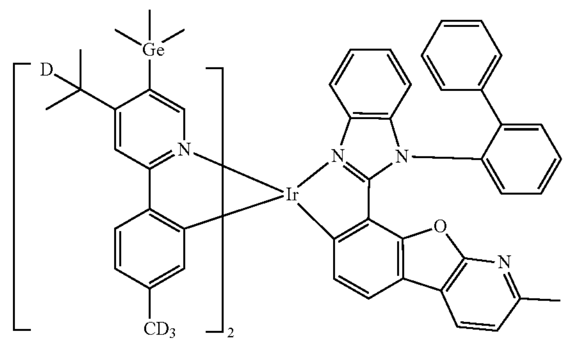
3275
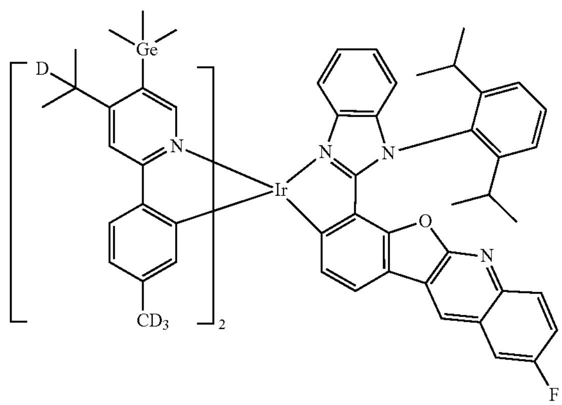
3276
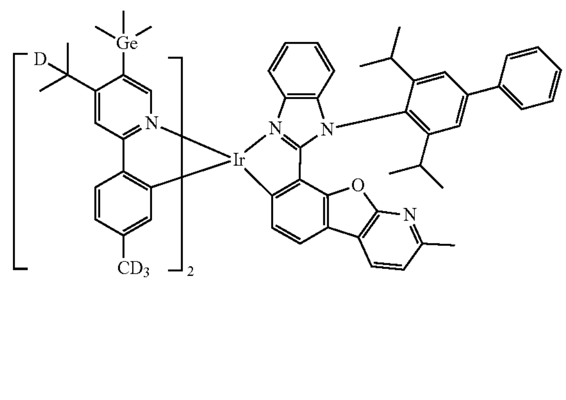
3277
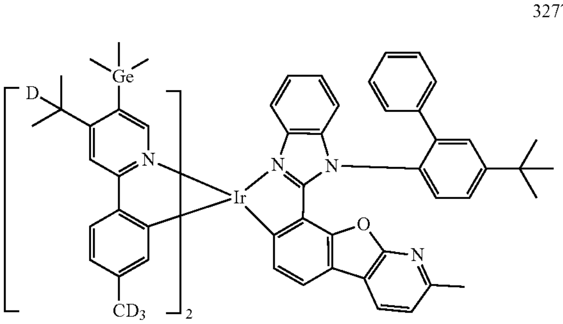
3278
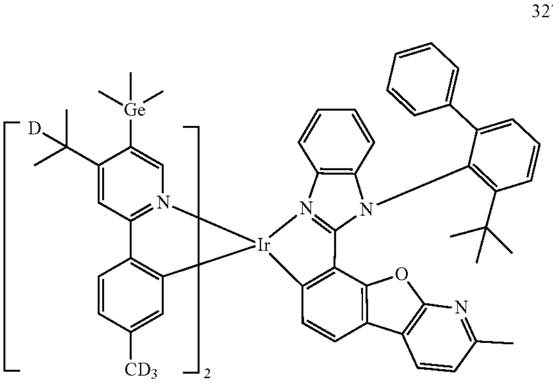

-continued
3279
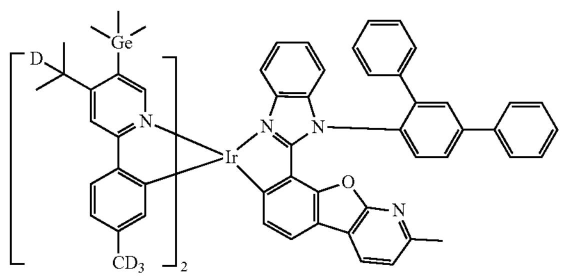
3280
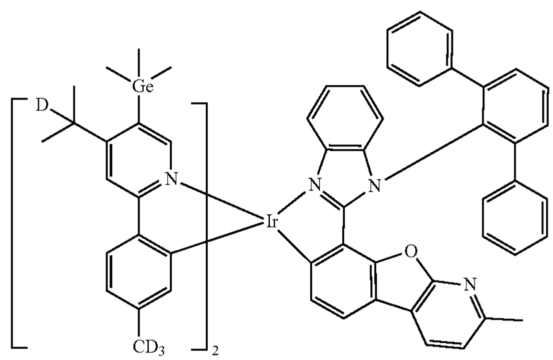
3281
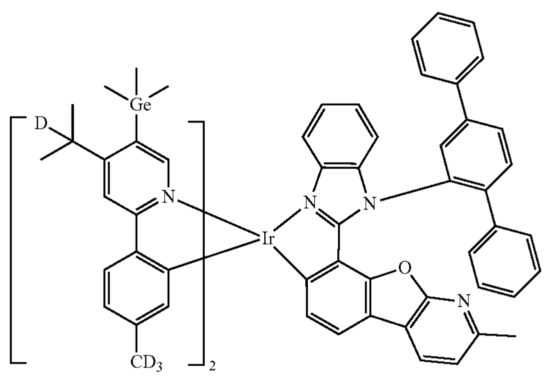
3282
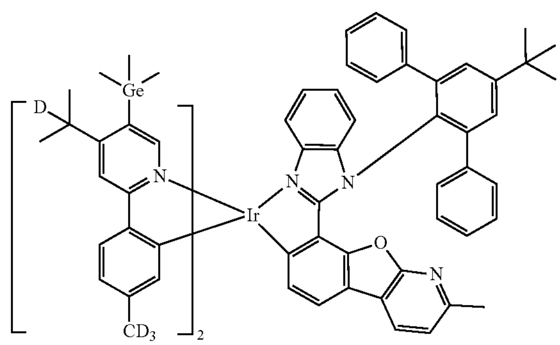
3283
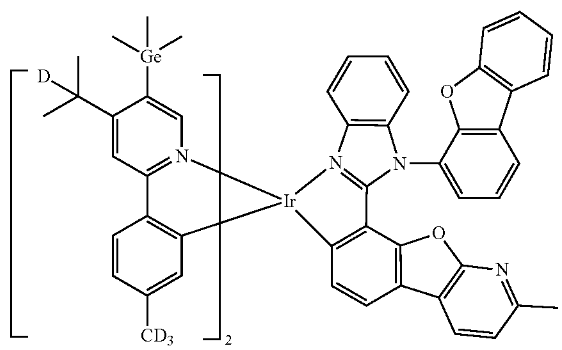
3284
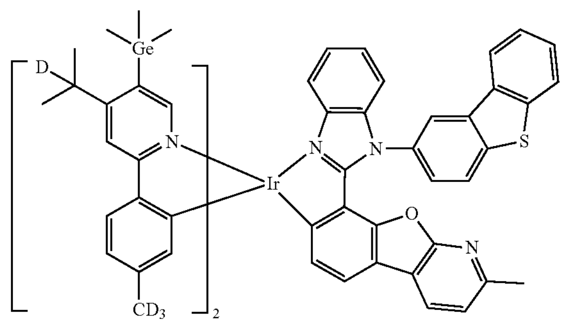
3285
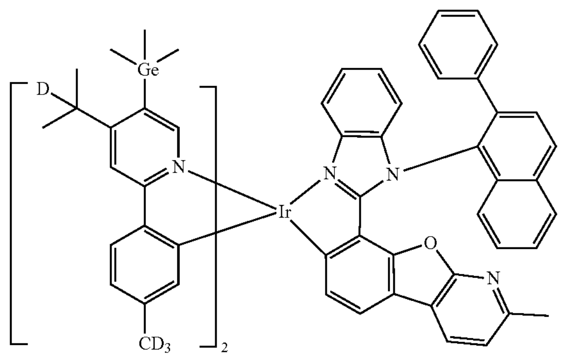
3286
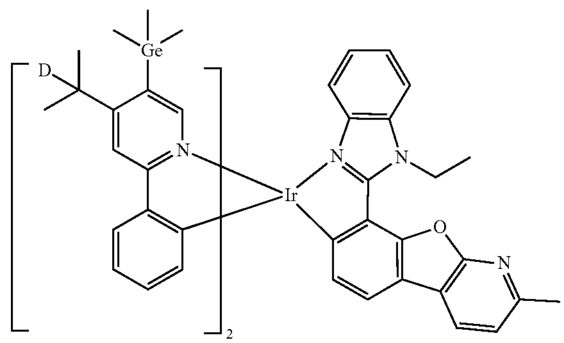

-continued
3287
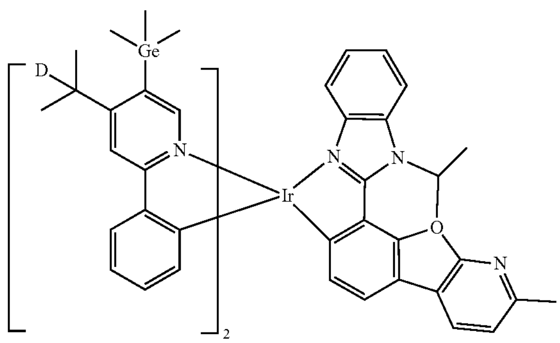
3288
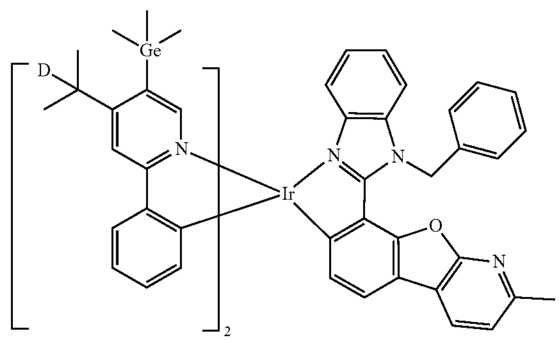
3289
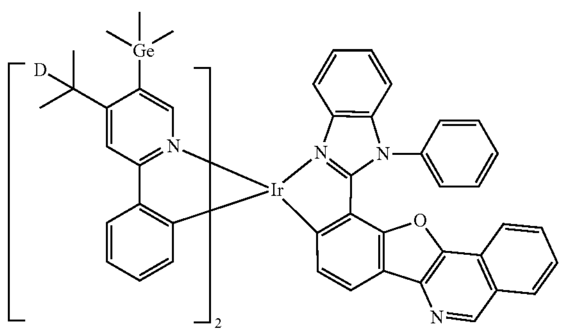
3290
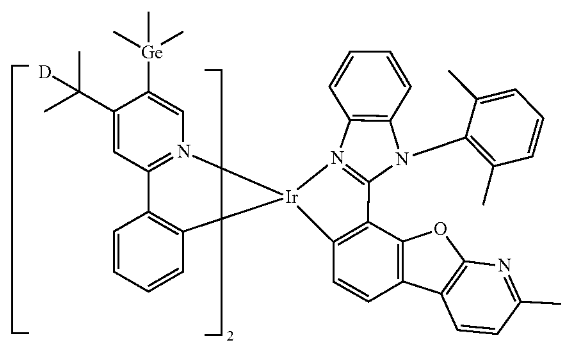
3291
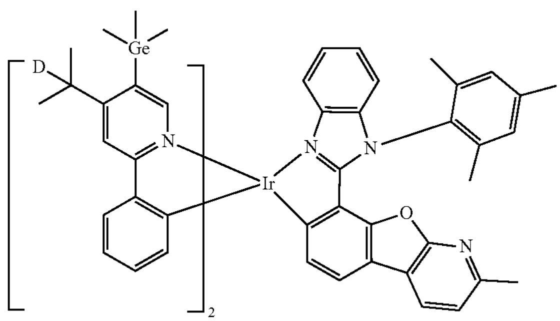
3292
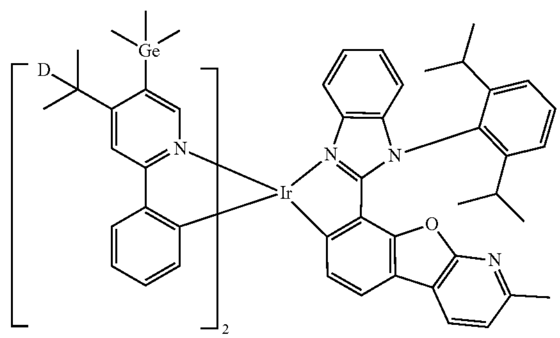
3293
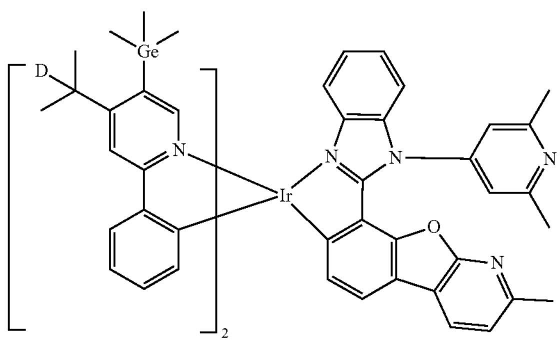
3294
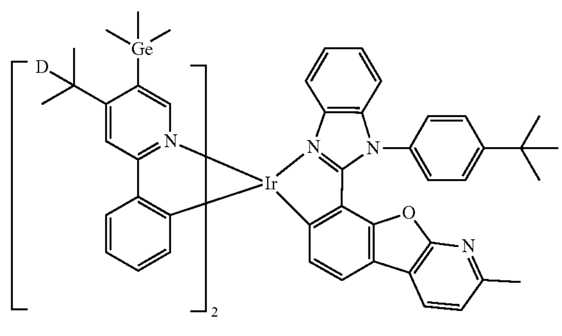

-continued
3295
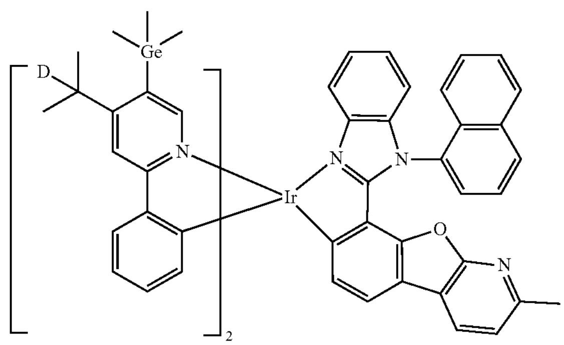
3296
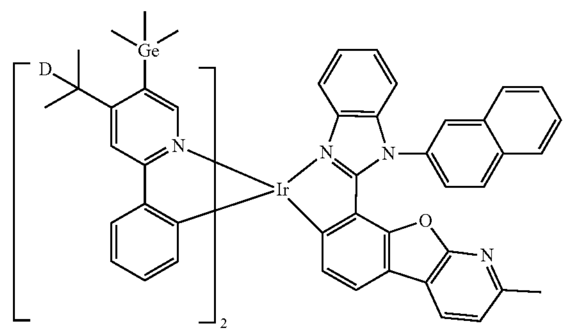
3297
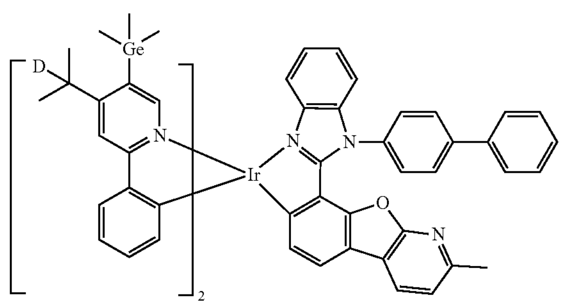
3298
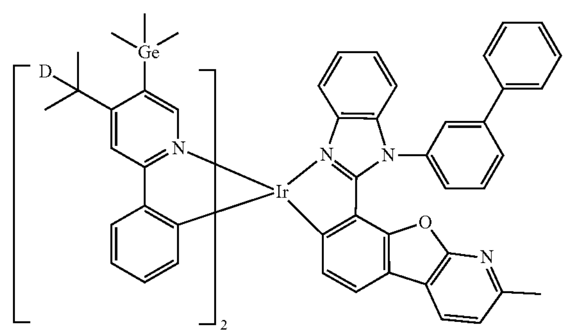
3299
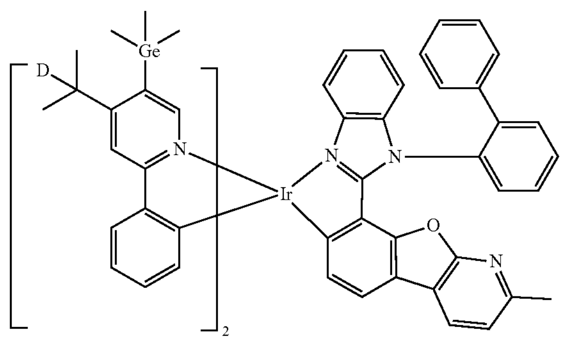
3300
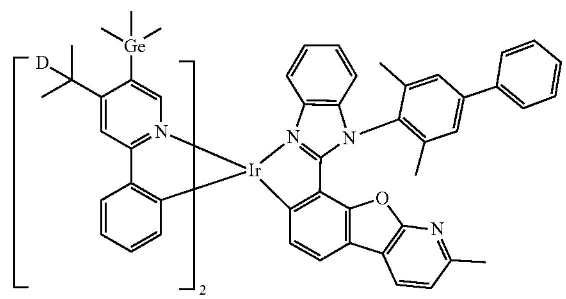
3301
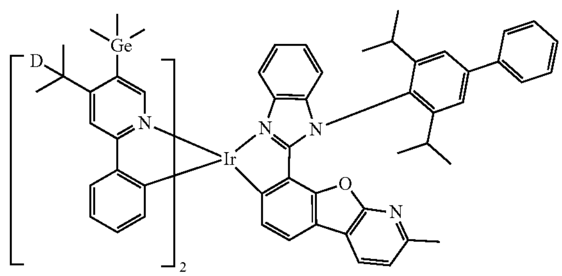
3302
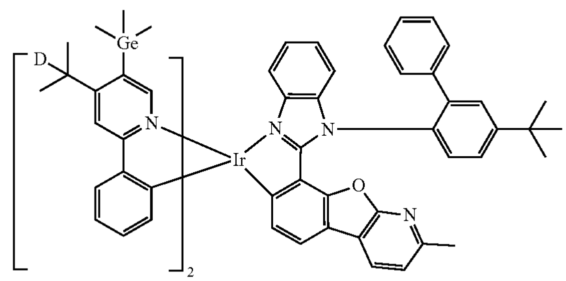

-continued
3303
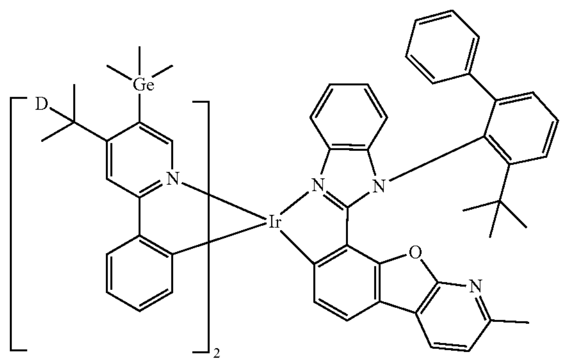
3304
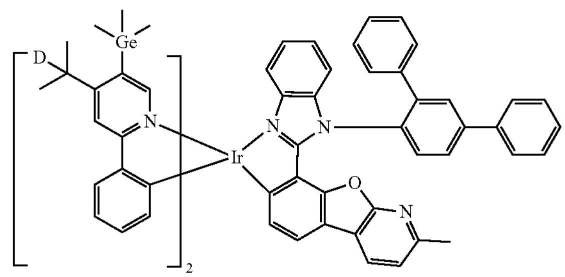
3305
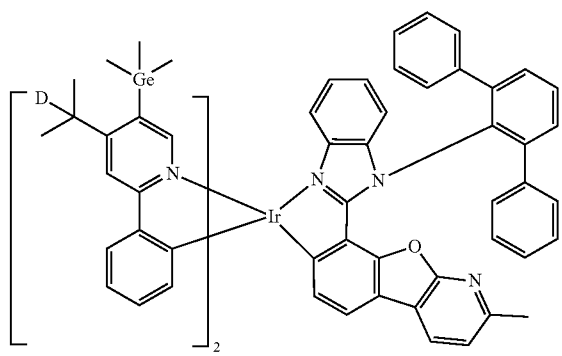
3306
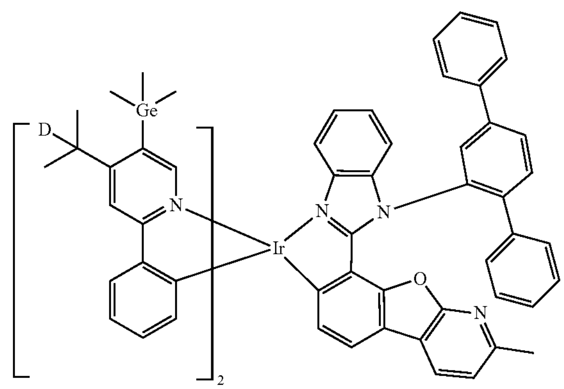
3307
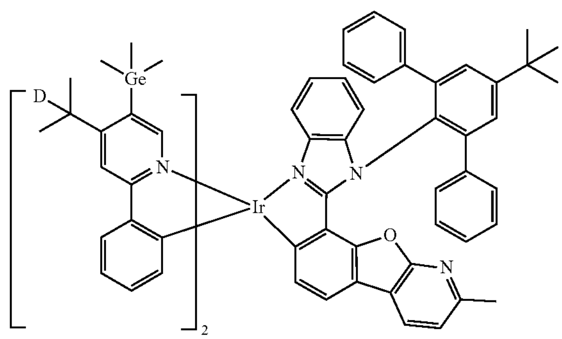
3308
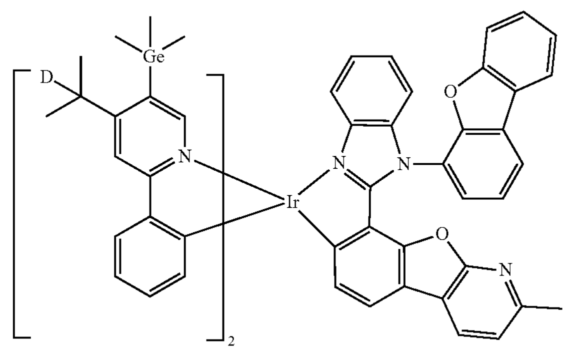
3309
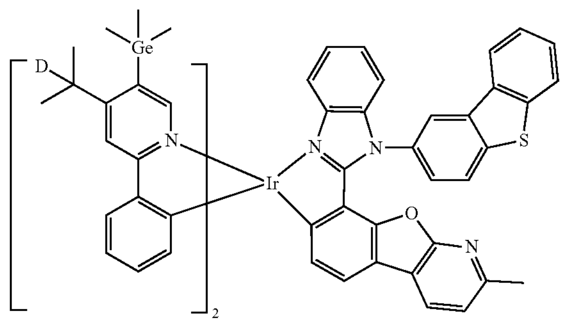
3310
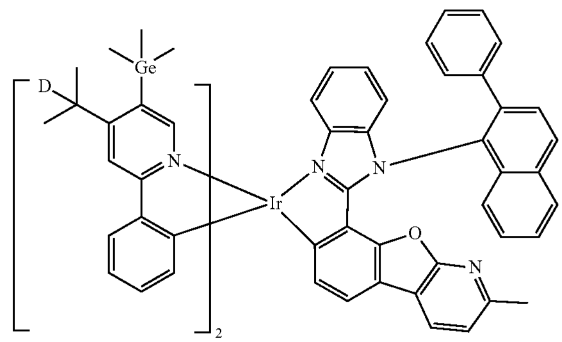

-continued
3311
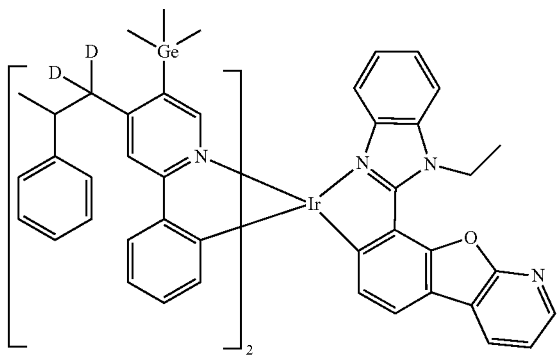
3312
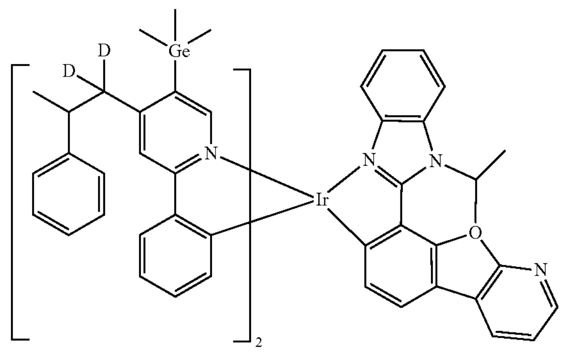
3313
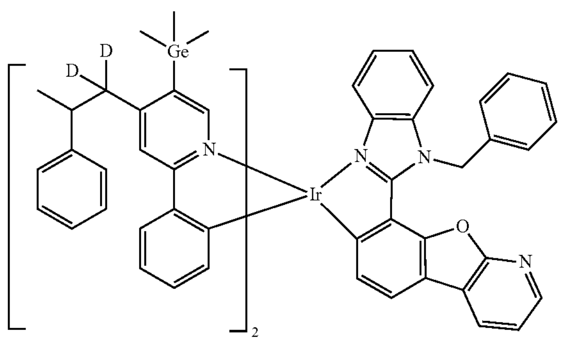
3314
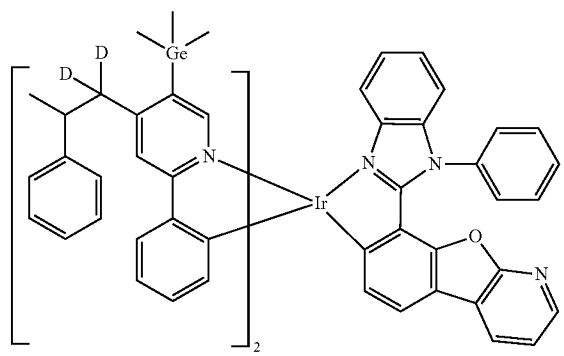
3315
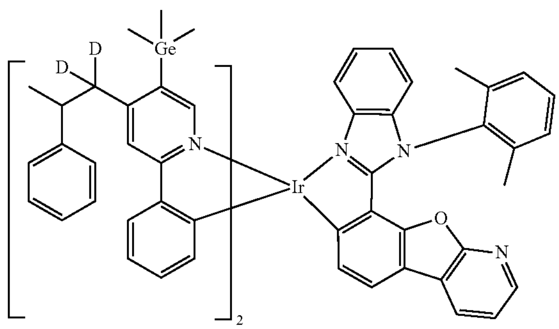
3316
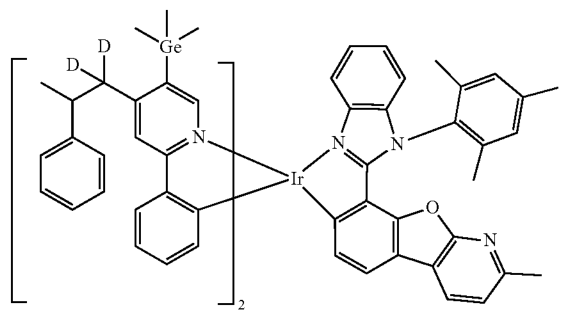
3317
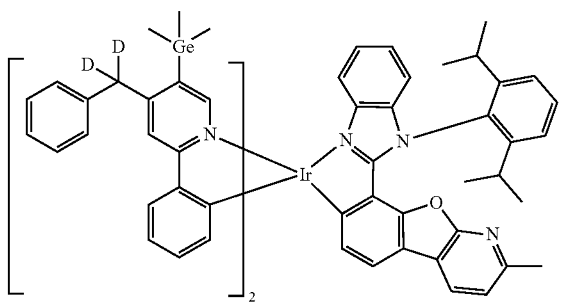
3318
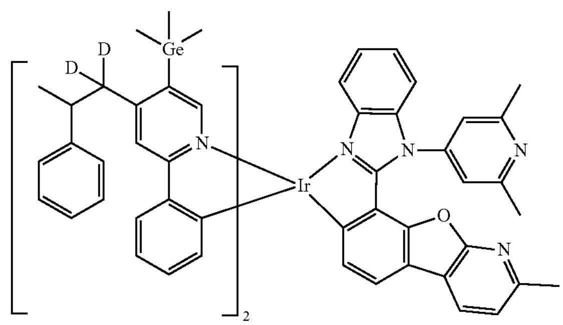

-continued
3319
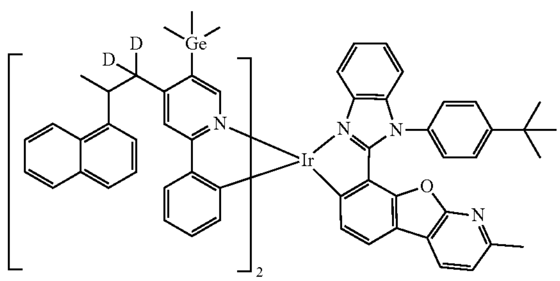
3320
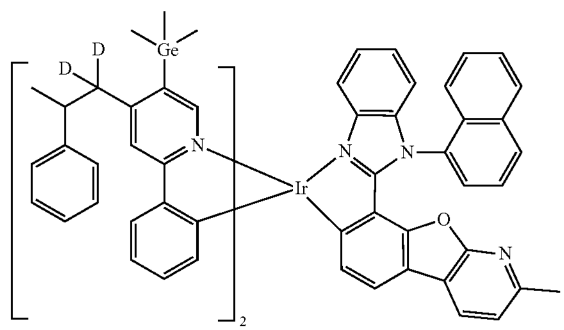
3321
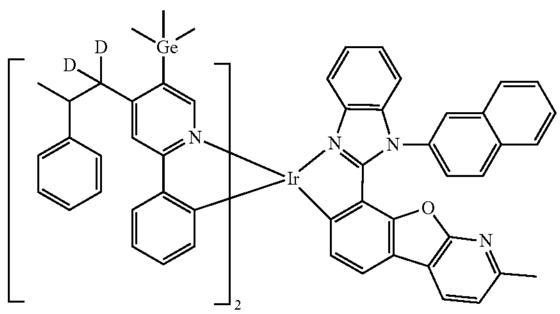
3322
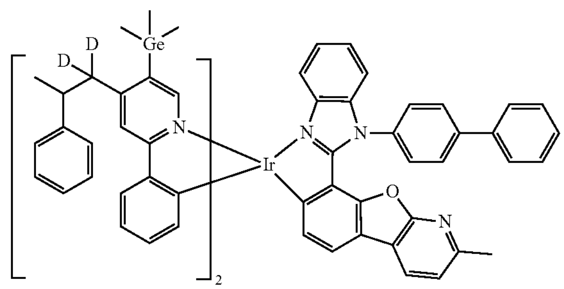
3323
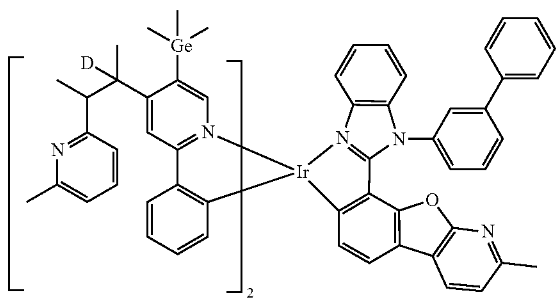
3324
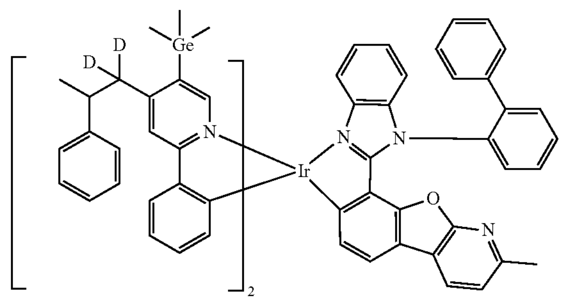
3325
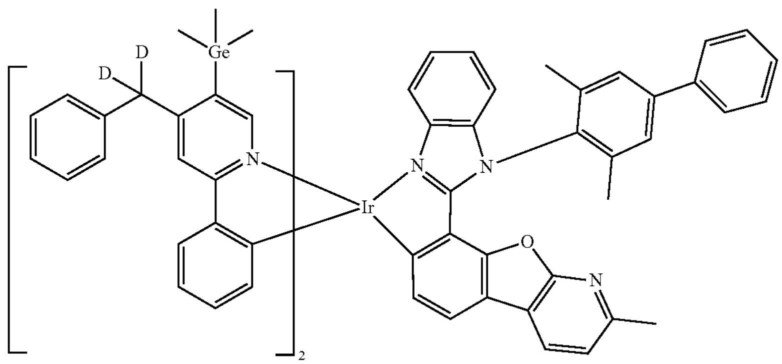

-continued
3326
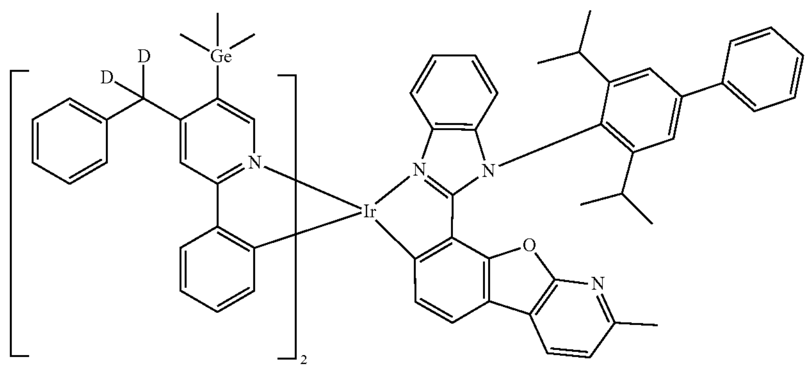
3327
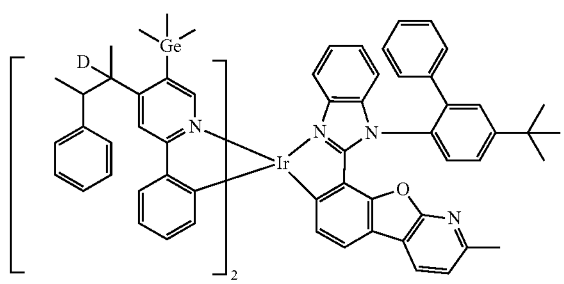
3328
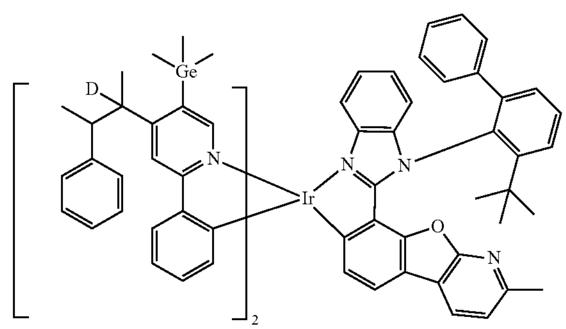
3329
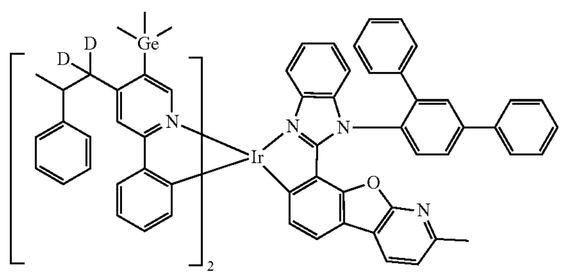
3330
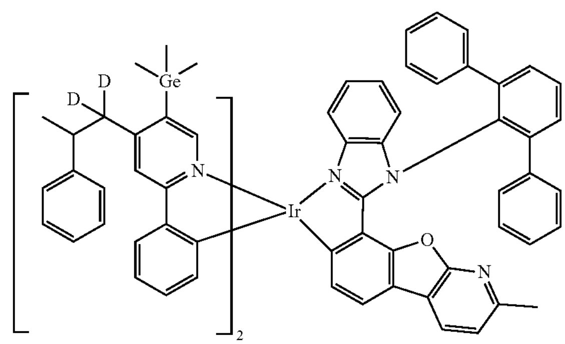
3331
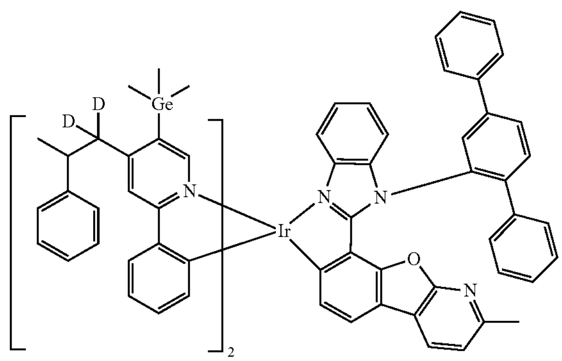
3332
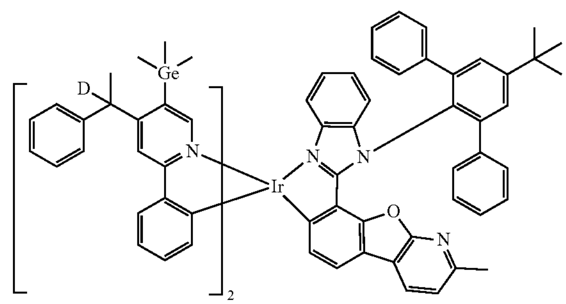

-continued
3333
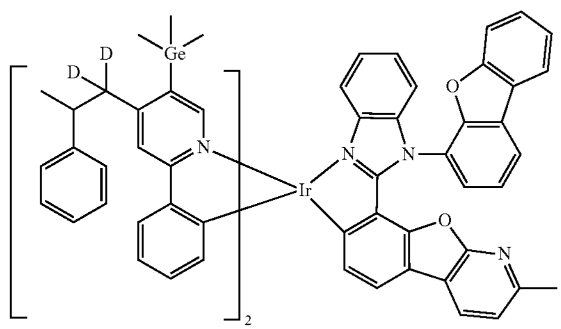
3334
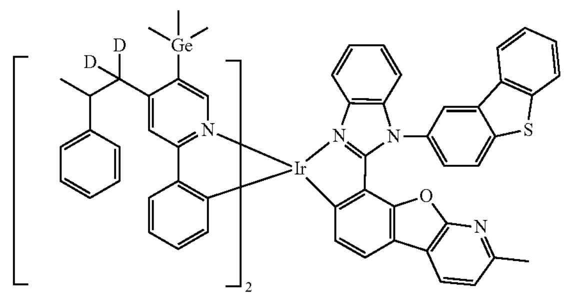
3335
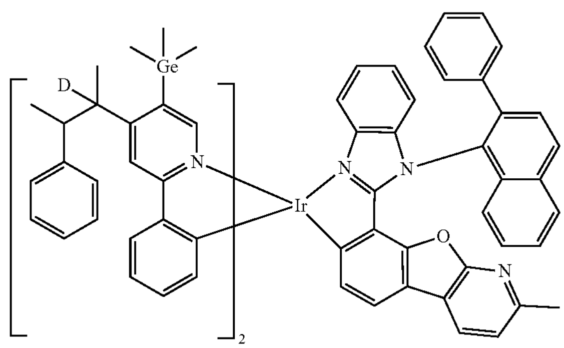
3336
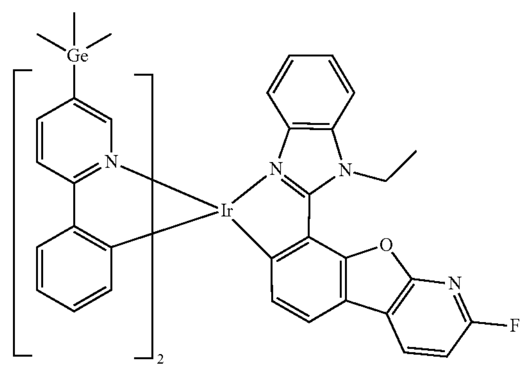
3337
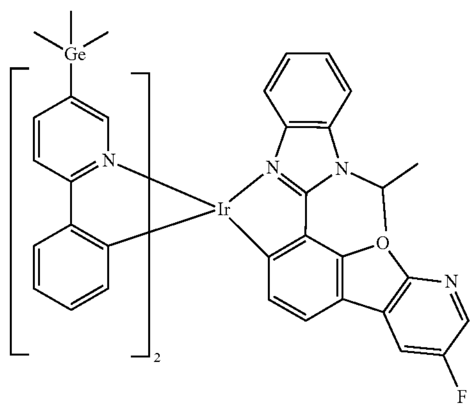
3338
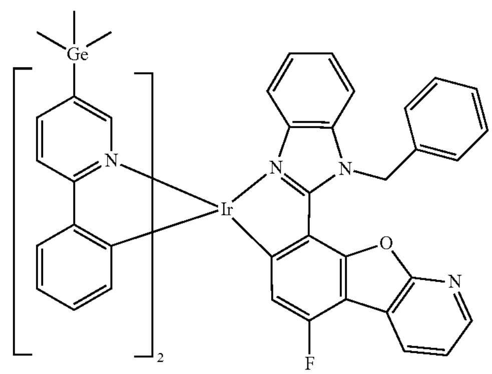
3339
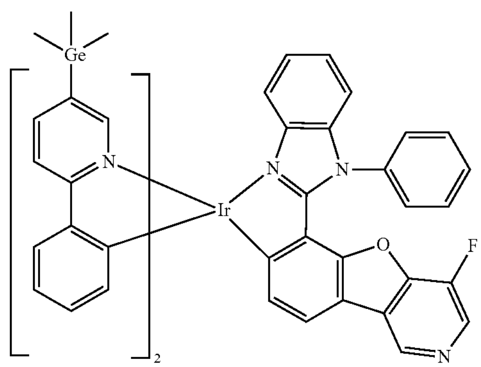
3340
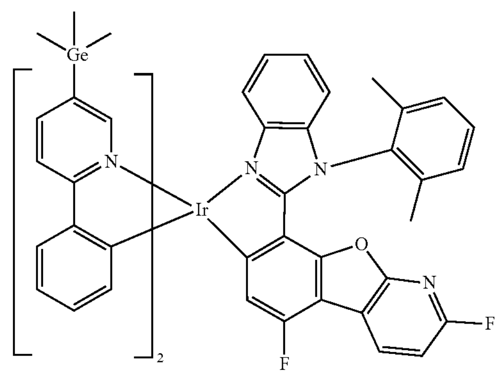

-continued
3341
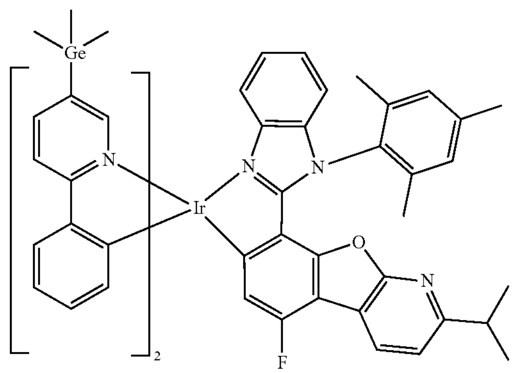
3342
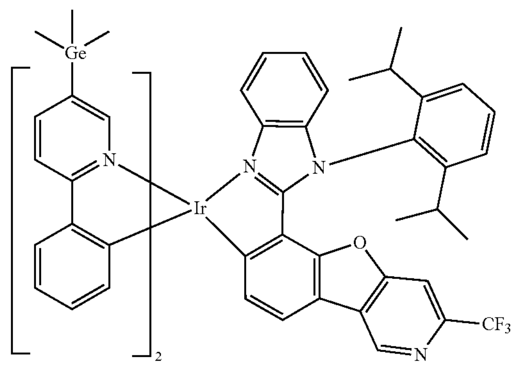
3343
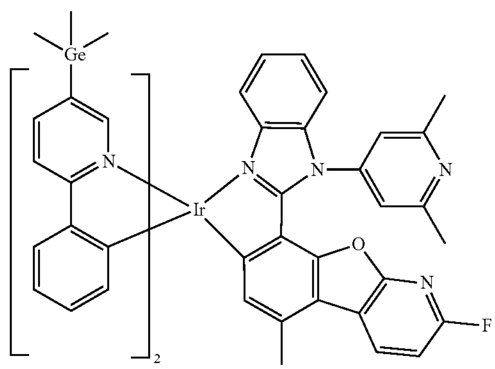
3344
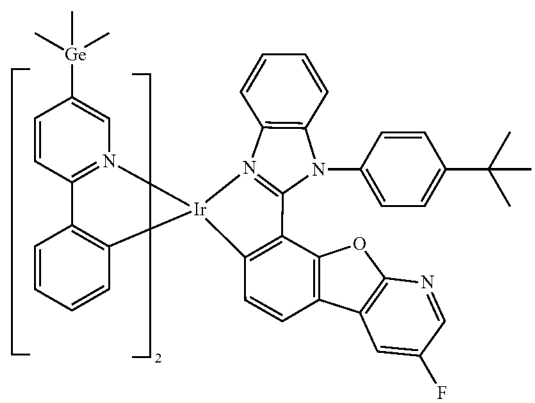
3345
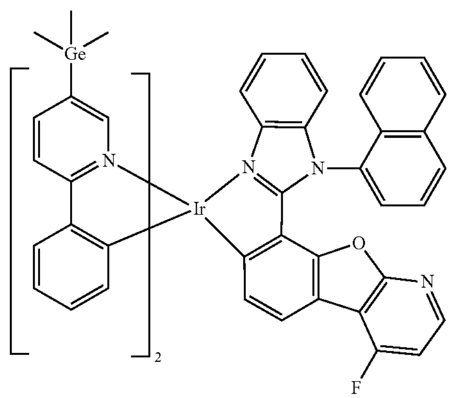
3346
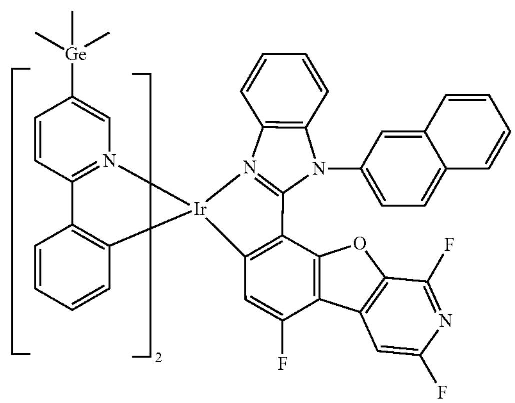

-continued
3347
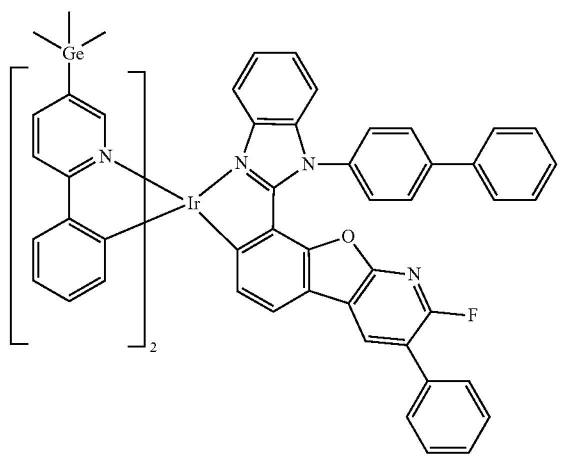
3348
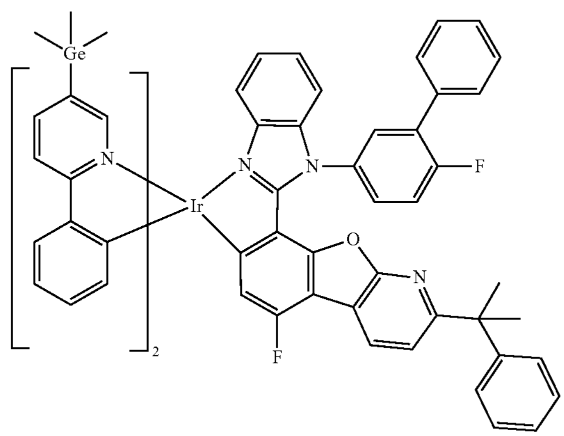
3349
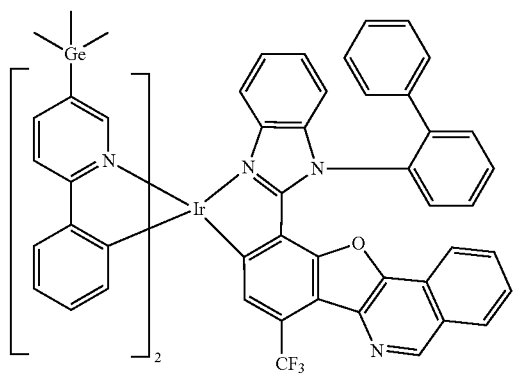
3350
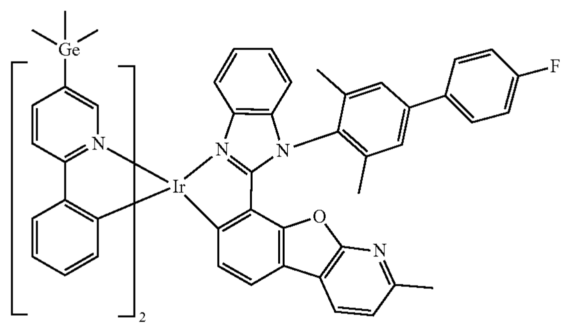
3351
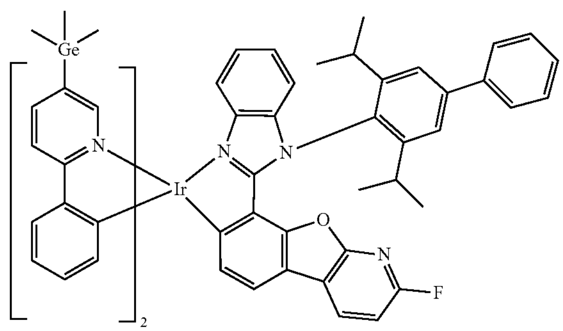
3352
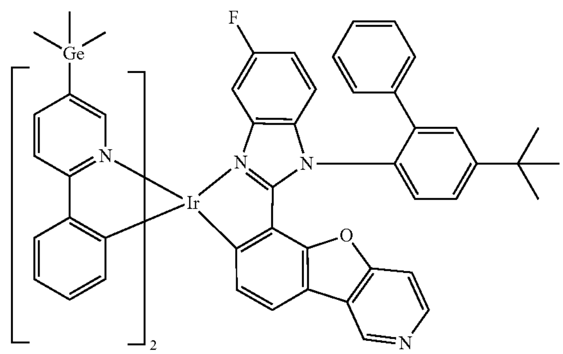

-continued
3353
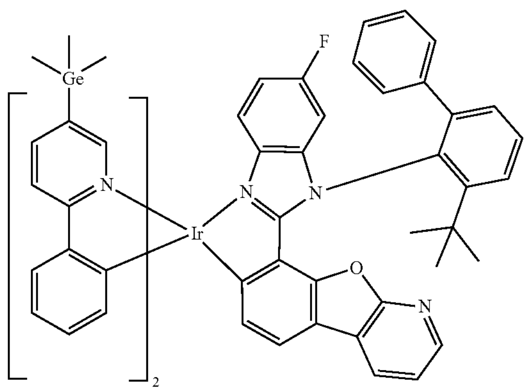
3354
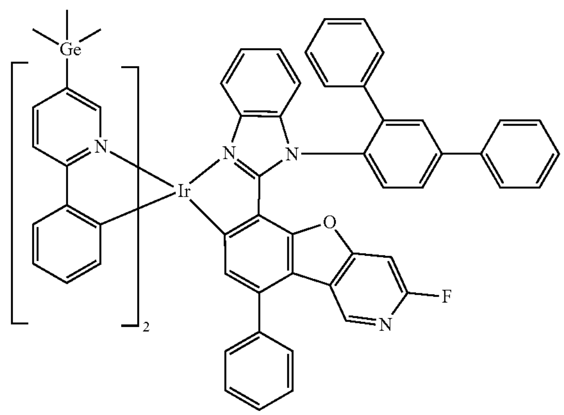
3355
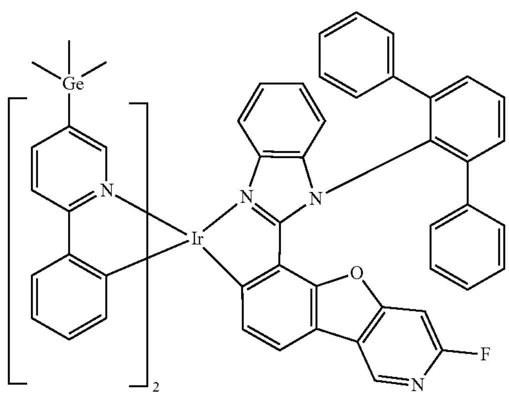
3356
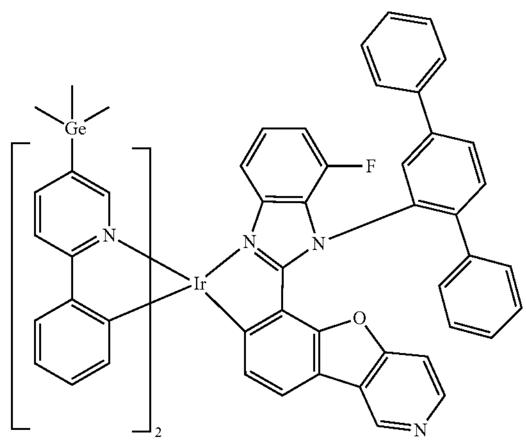
3357
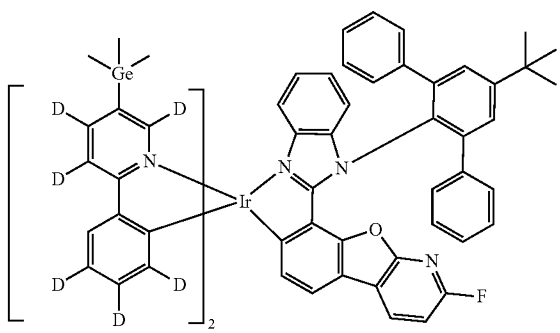
3358
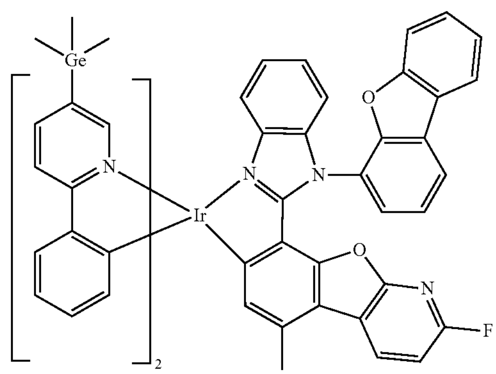

-continued
3359
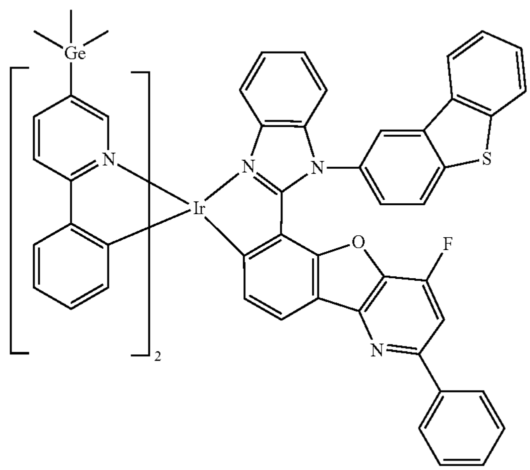
3360
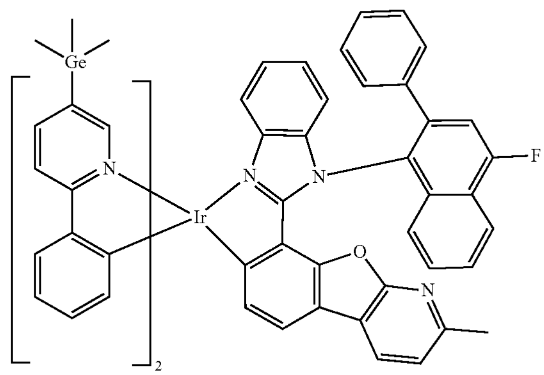
3361
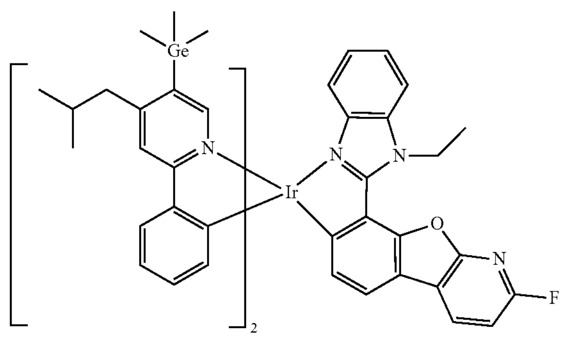
3362
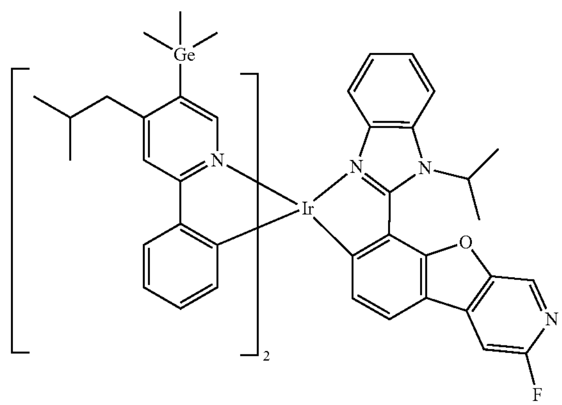
3363
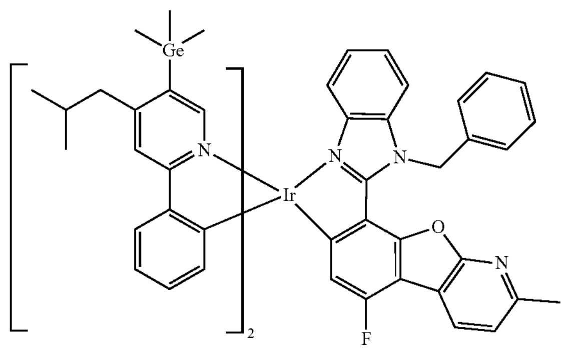
3364
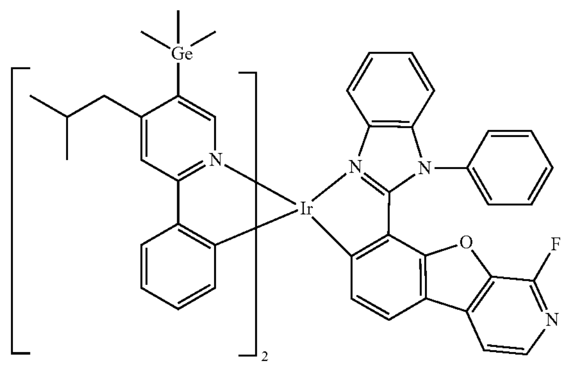

-continued
3365
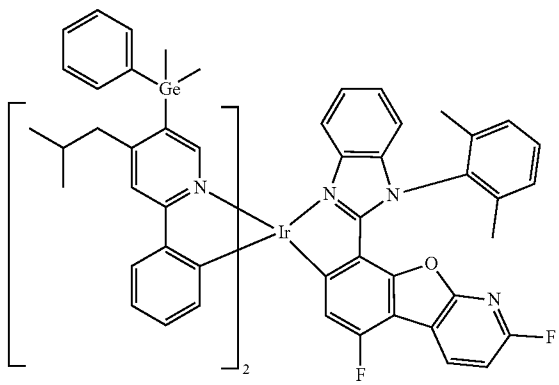
3366
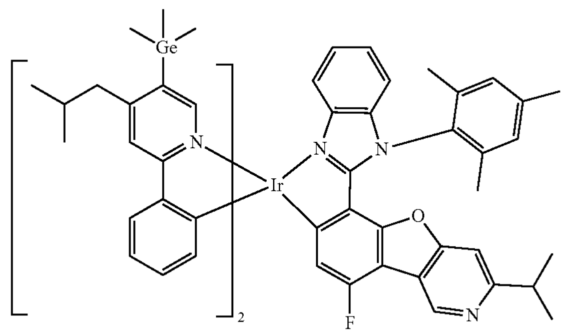
3367
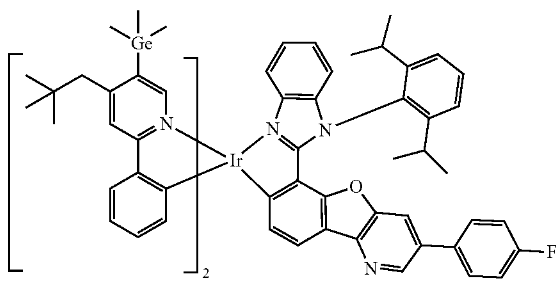
3368
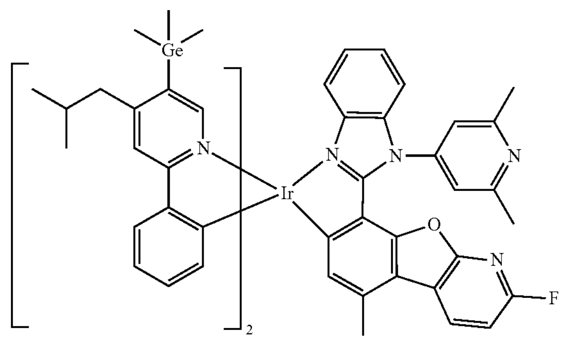
3369
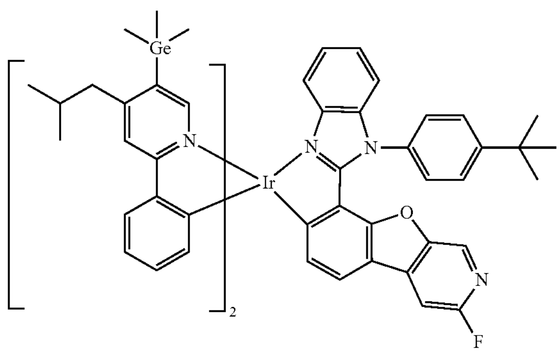
3370
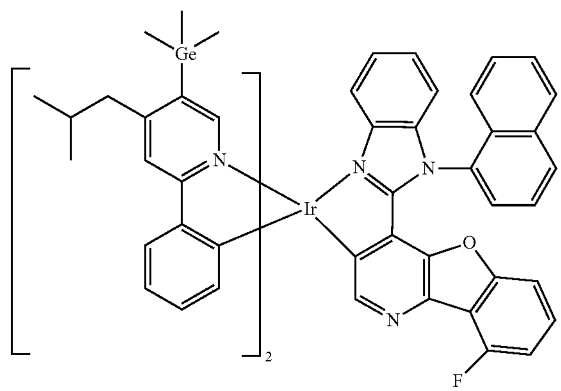
3371
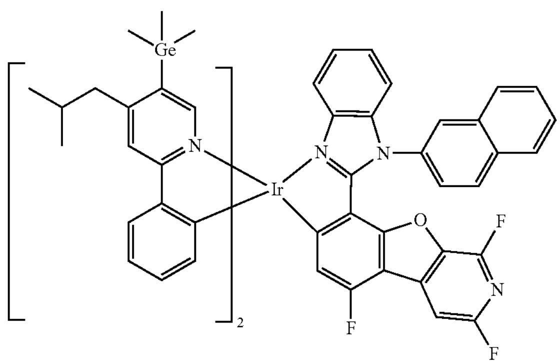
3372
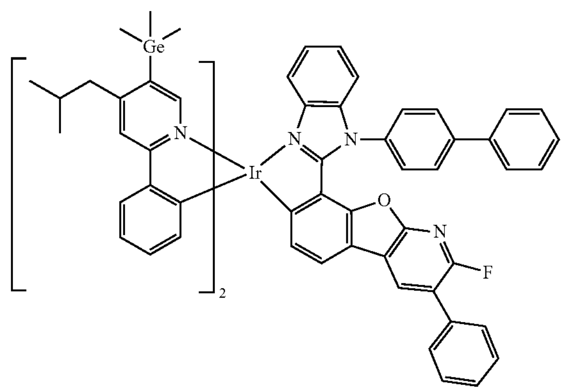

-continued
3373
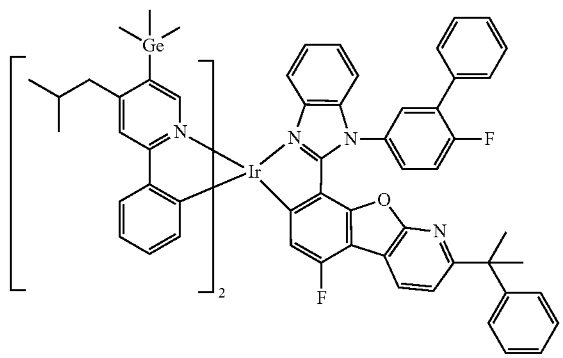
3374
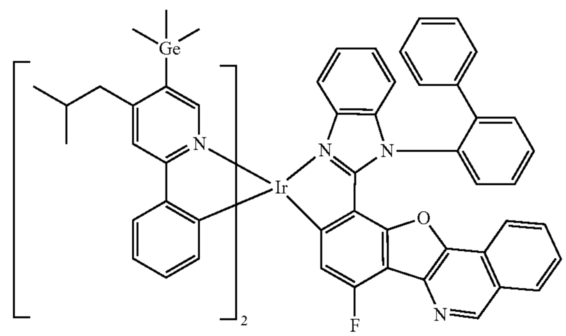
3375
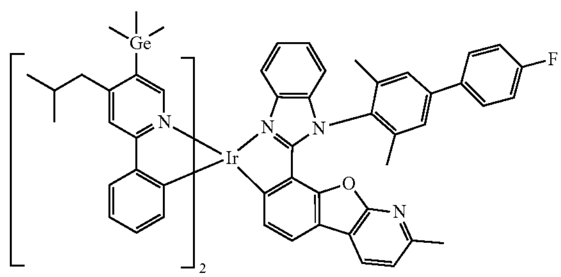
3376
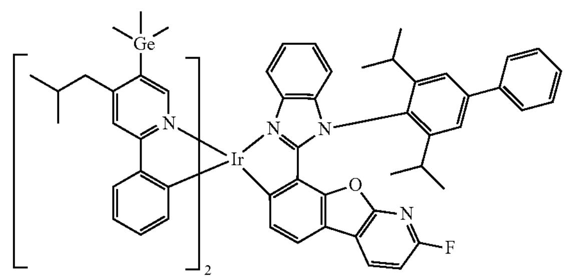
3377
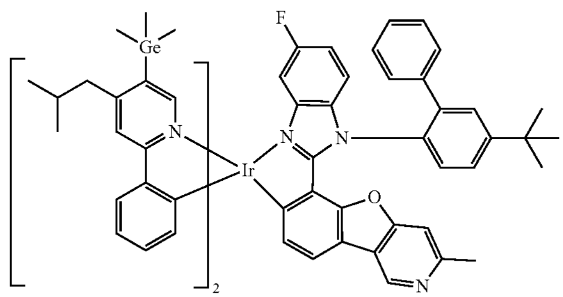
3378
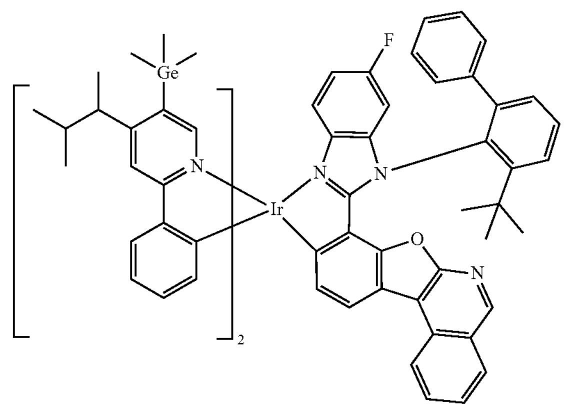
3379
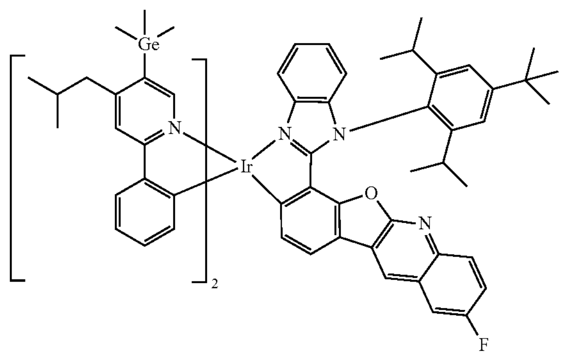
3380
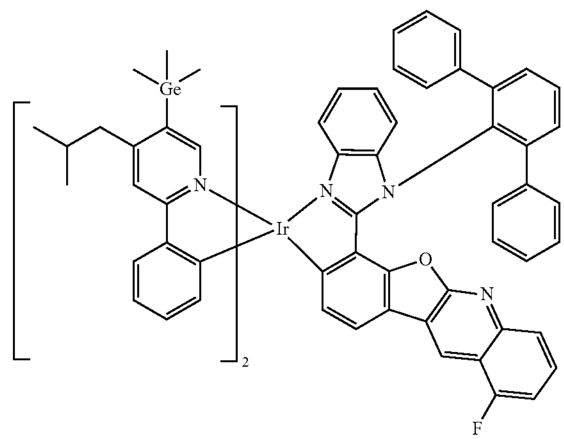

-continued
3381
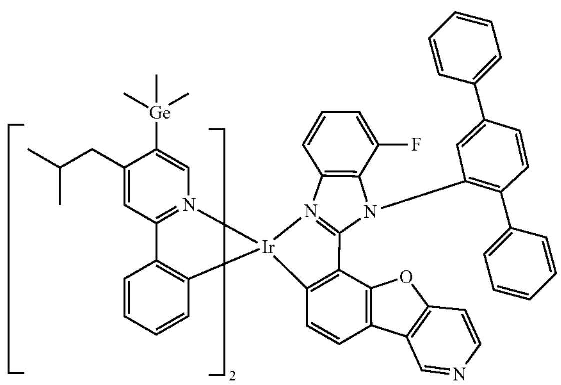
3382
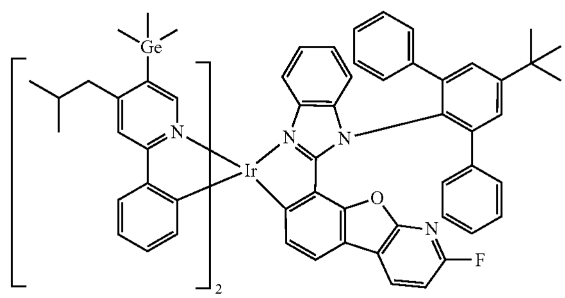
3383
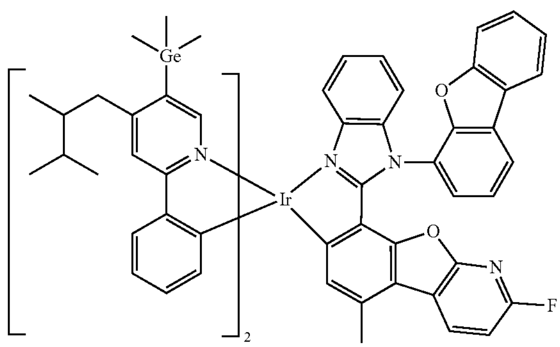
3384
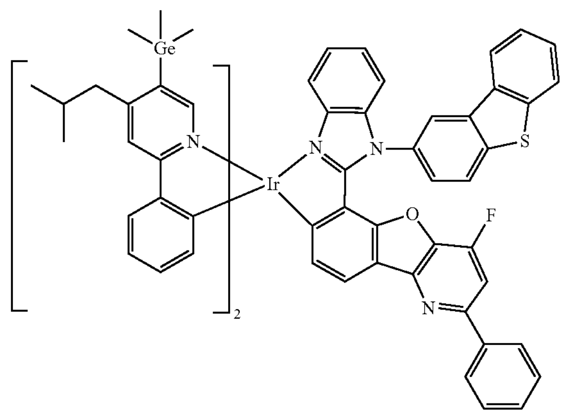
3385
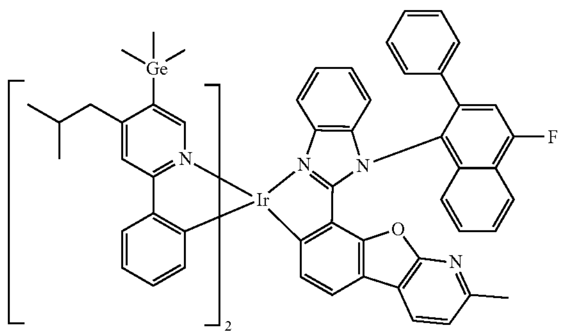
3386
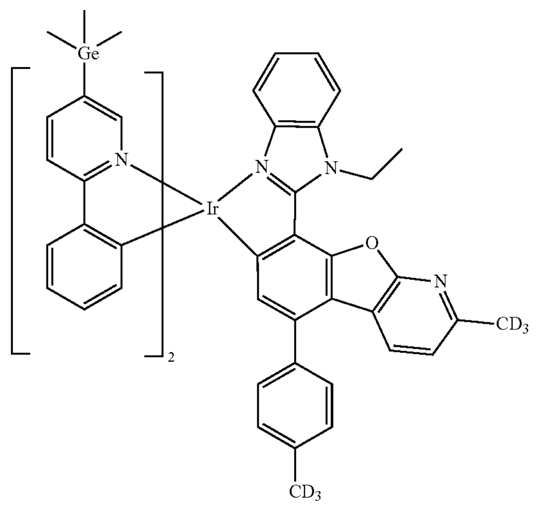

-continued
3387
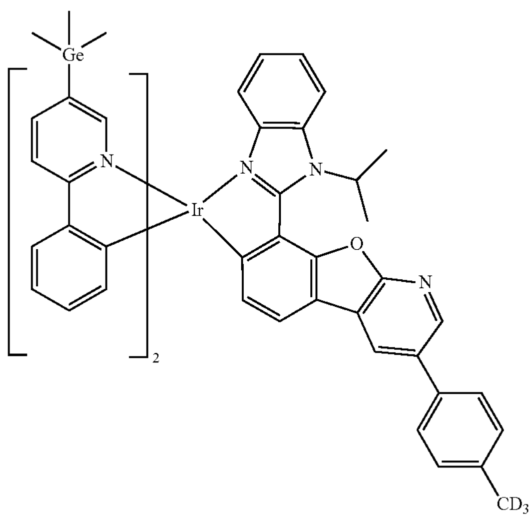
3388
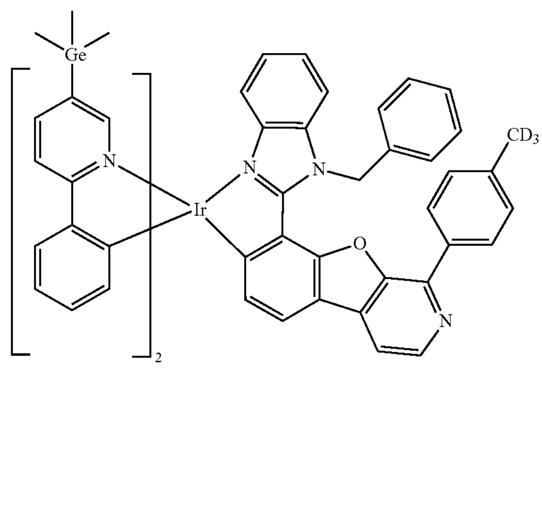
3389
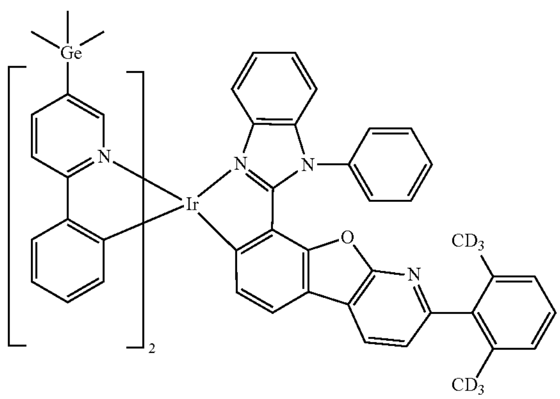
3390
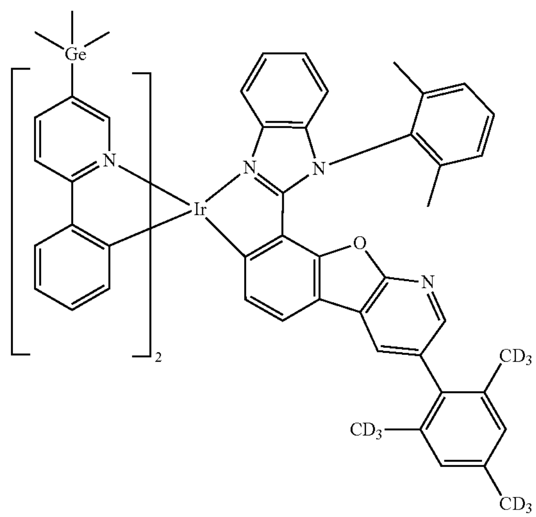
3391
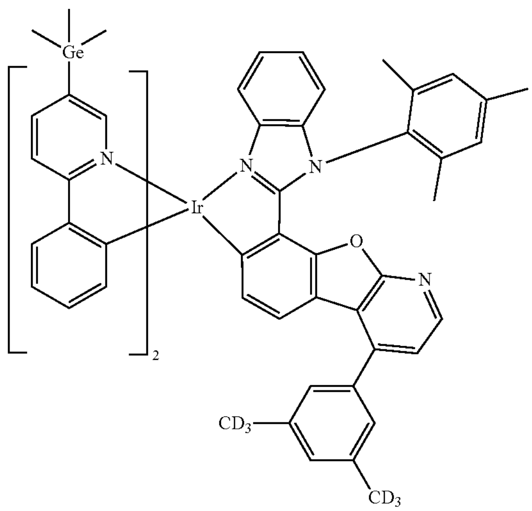
3392
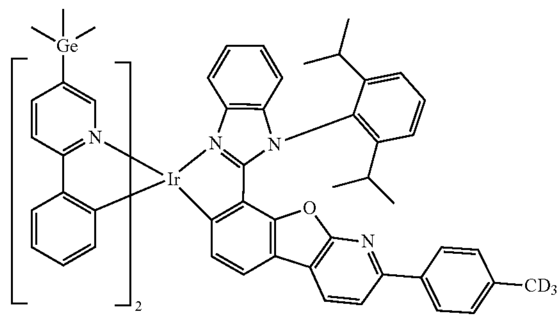

-continued
3393
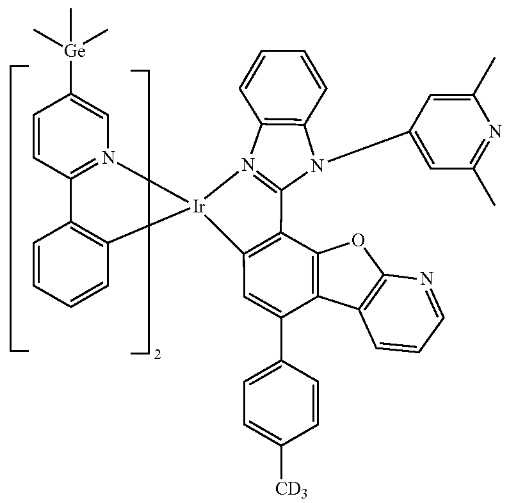
3394
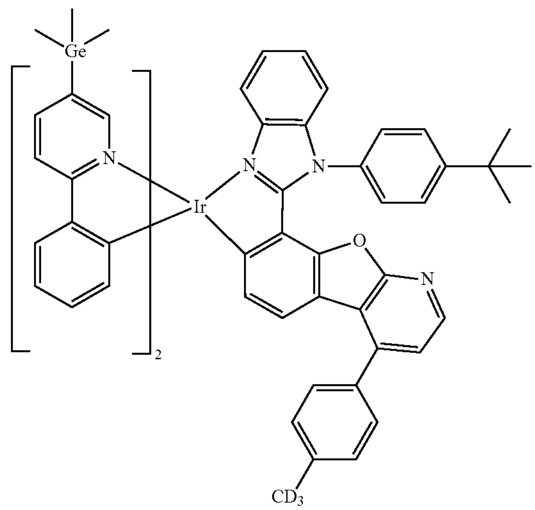
3395
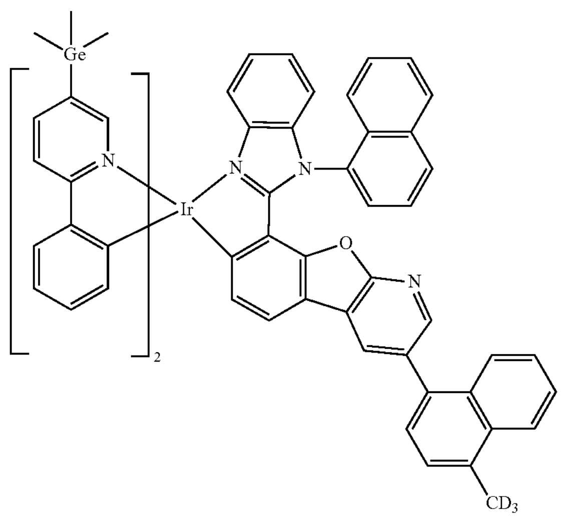
3396
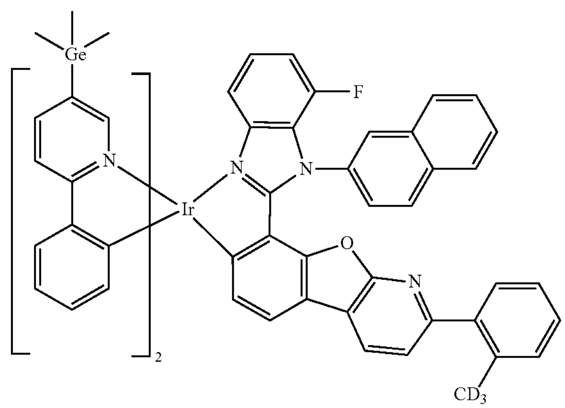
3397
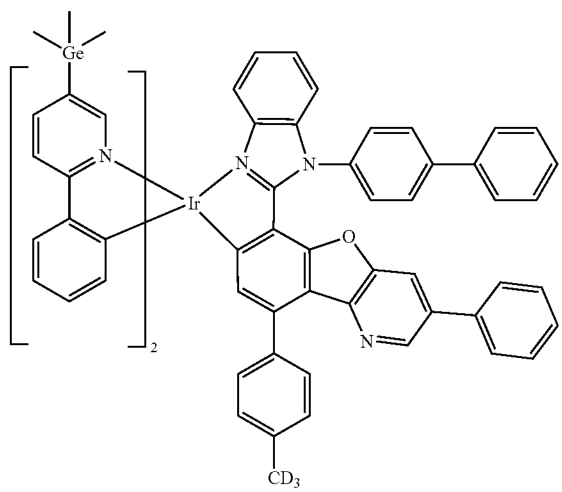
3398
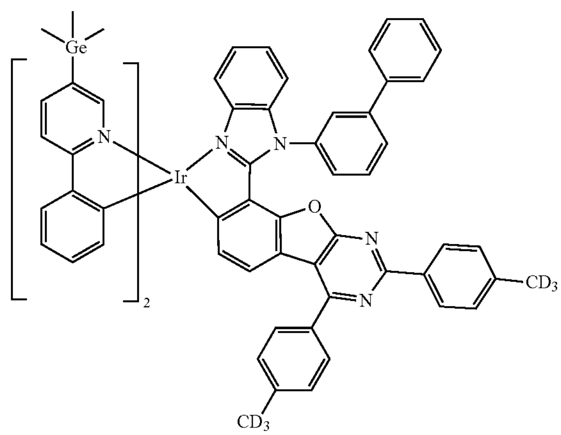

-continued
3399
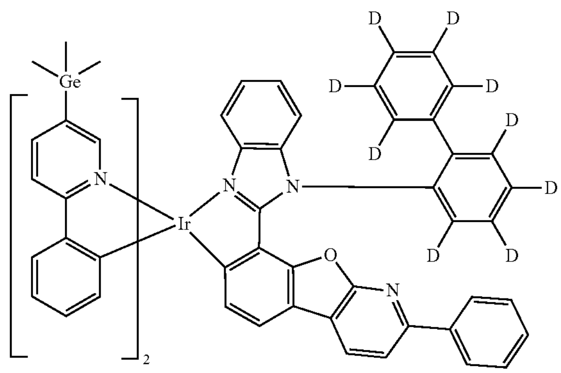
3400
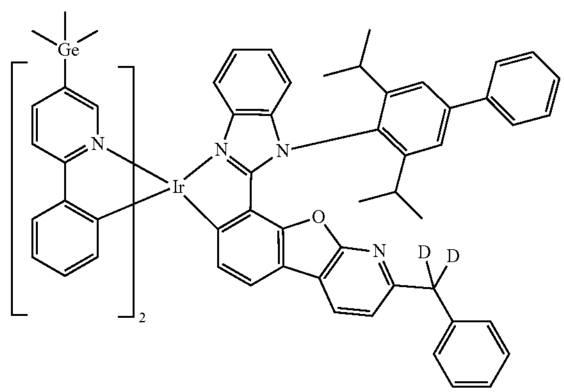
3401
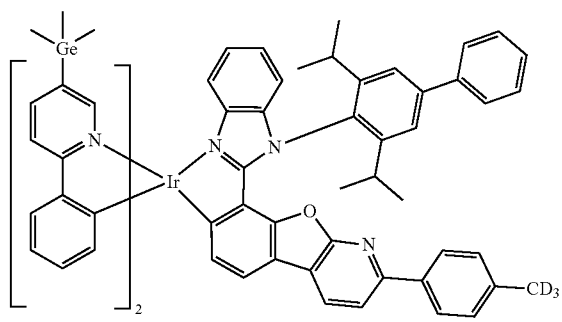
3402
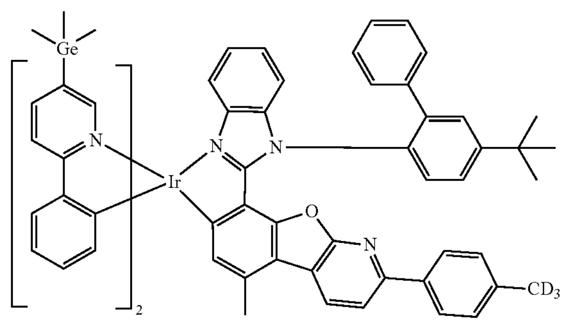
3403
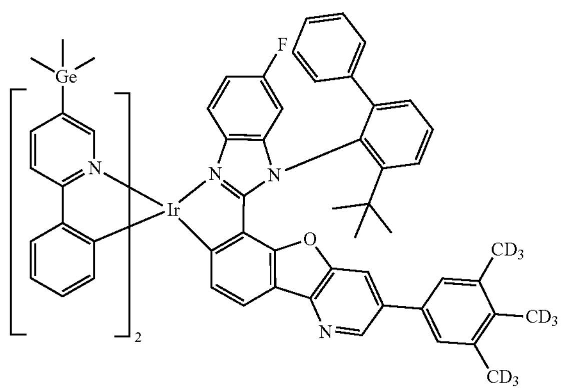
3404
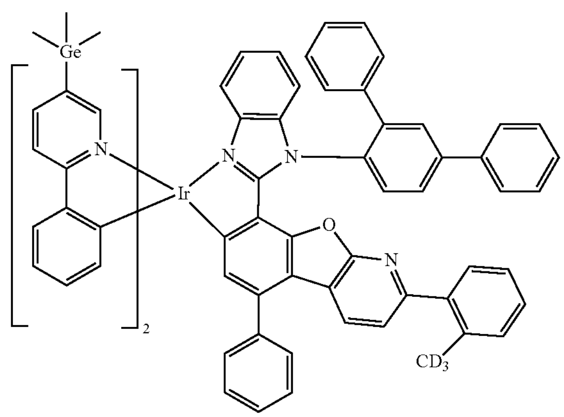

-continued
3405
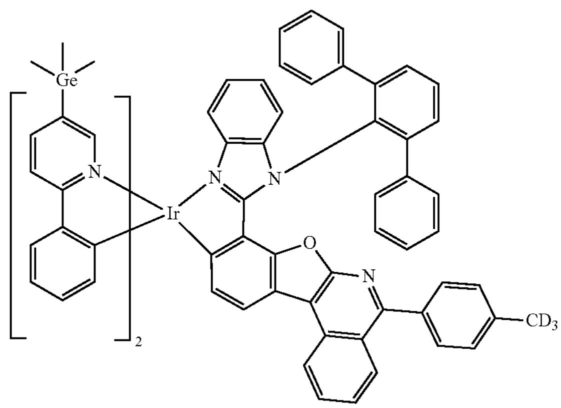
3406
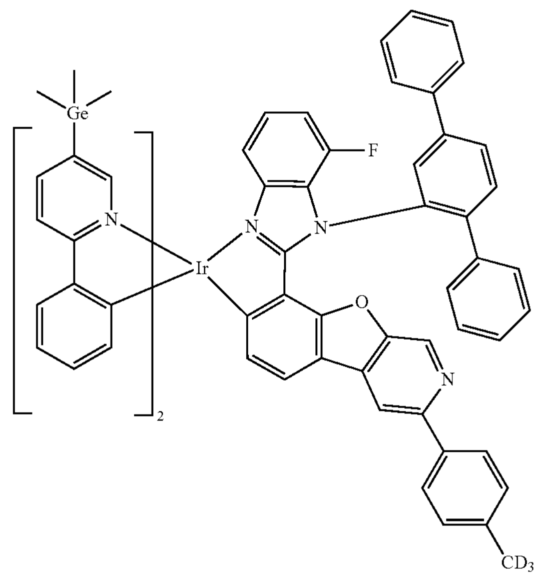
3407
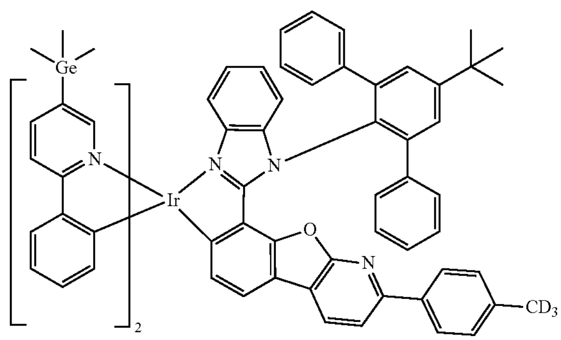
3408
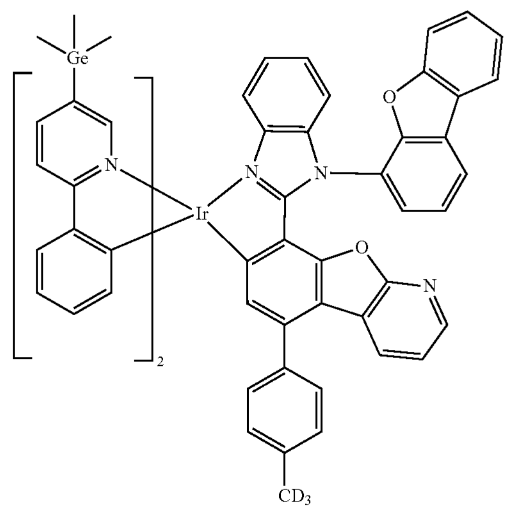
3409
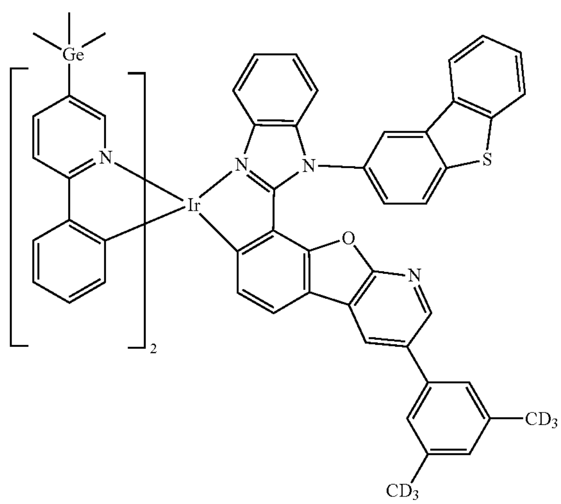
3410
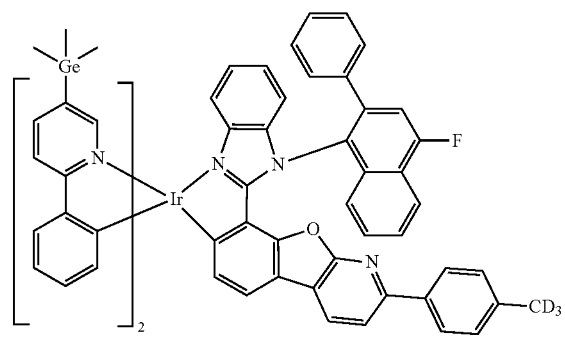

-continued
3411
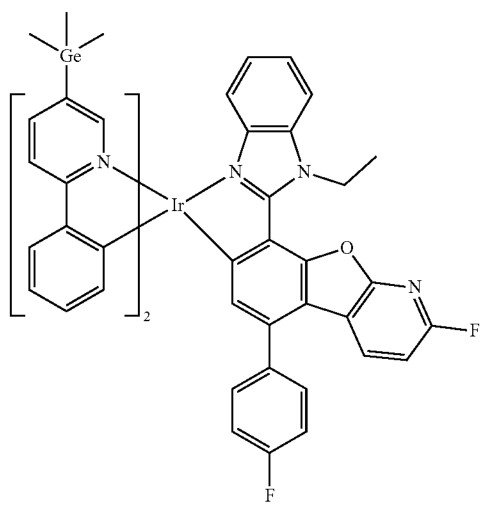
3412
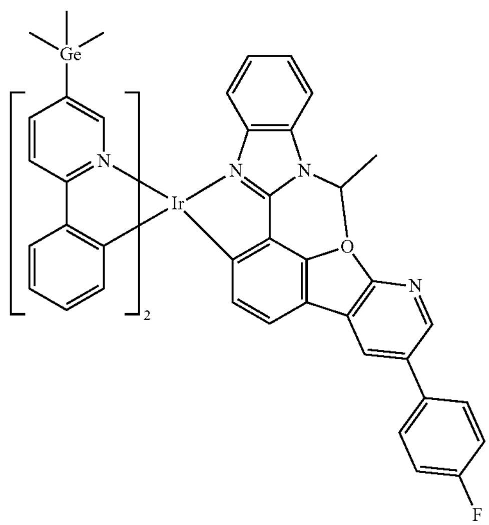
3413
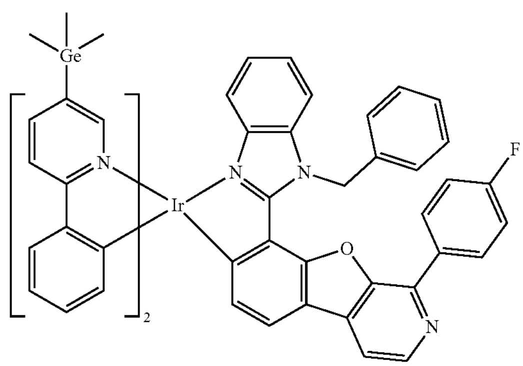
3414
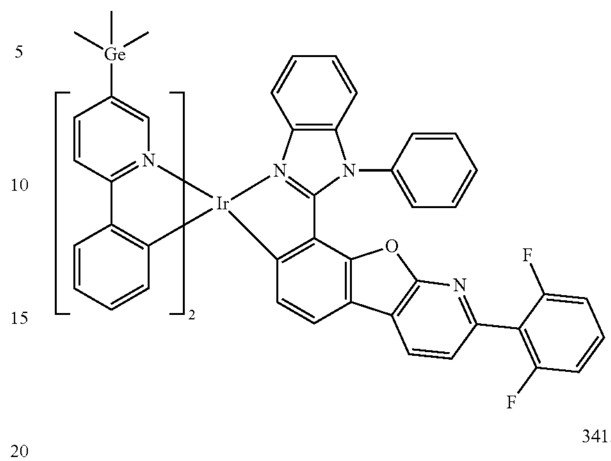
3415
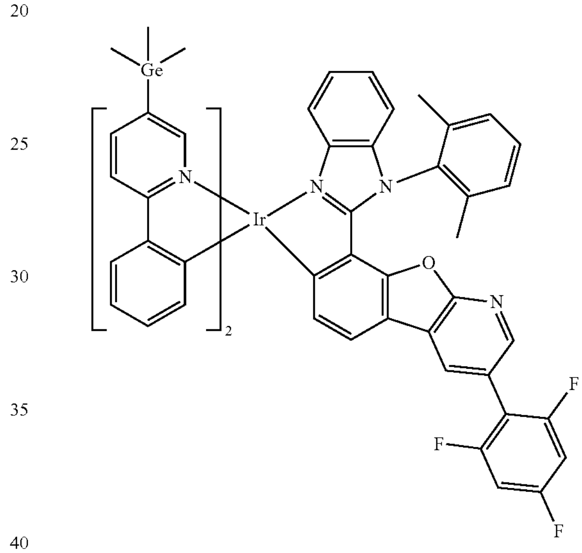
3416
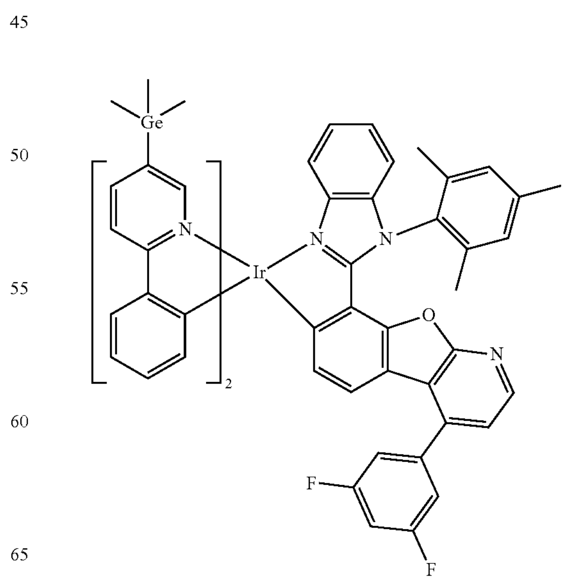

-continued
3417
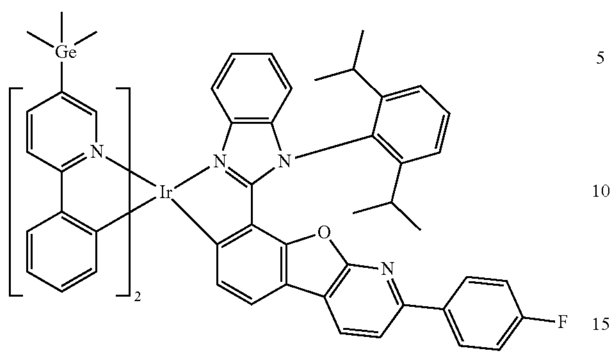
3418
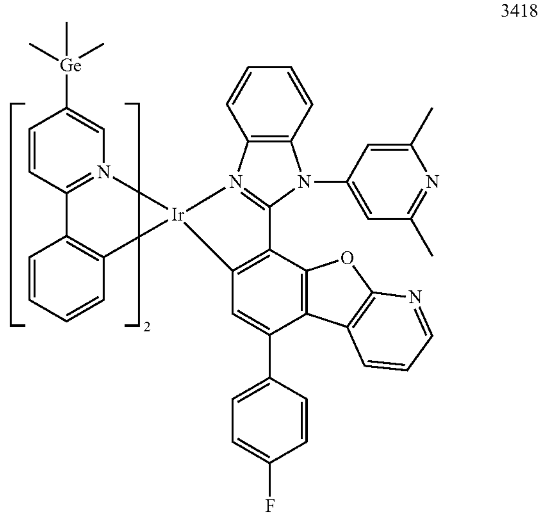
3419
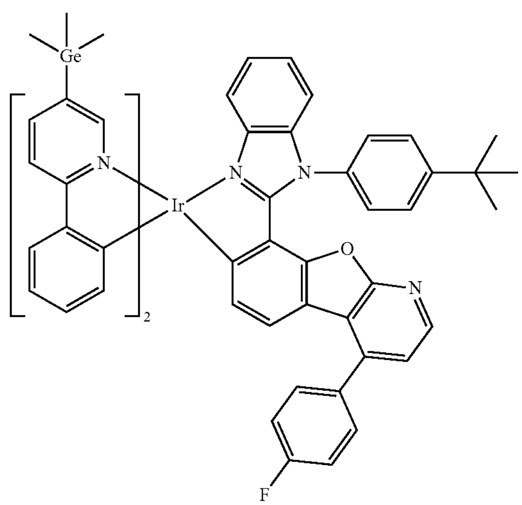
-continued
3420
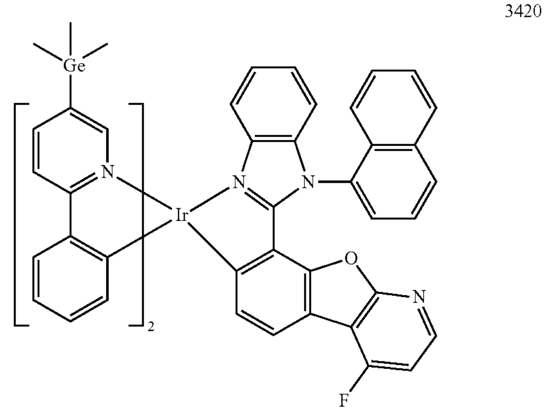
3421
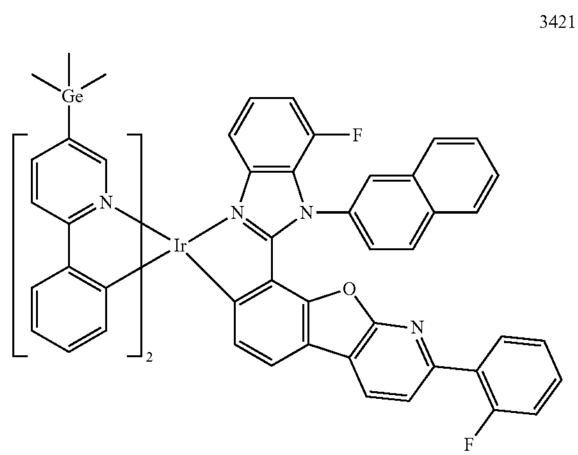
3422
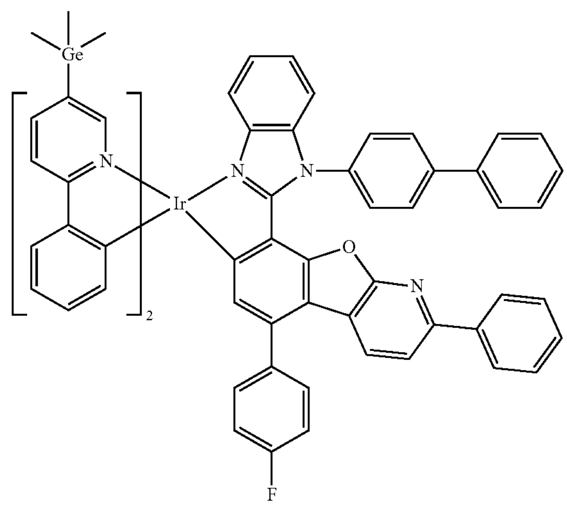

-continued
3423
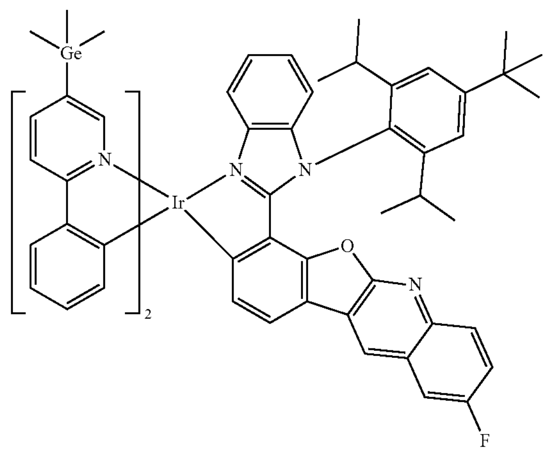
3424
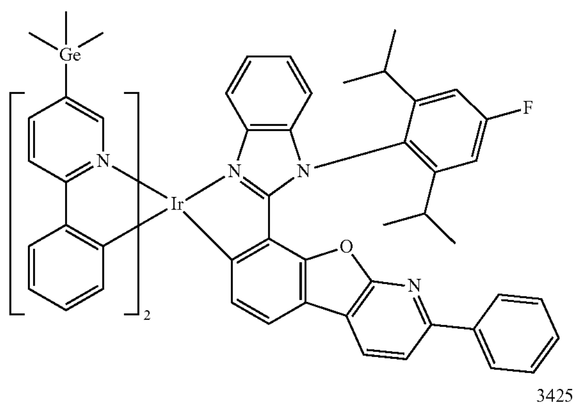
3425
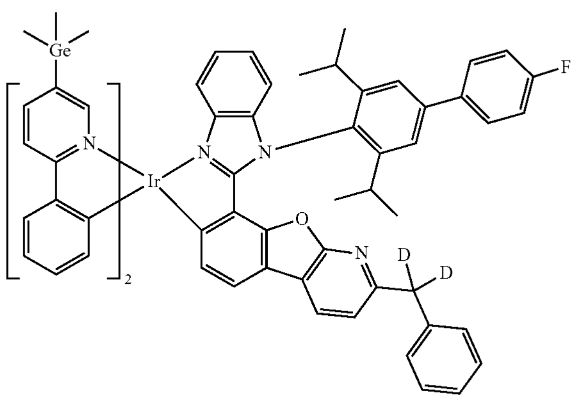
3426
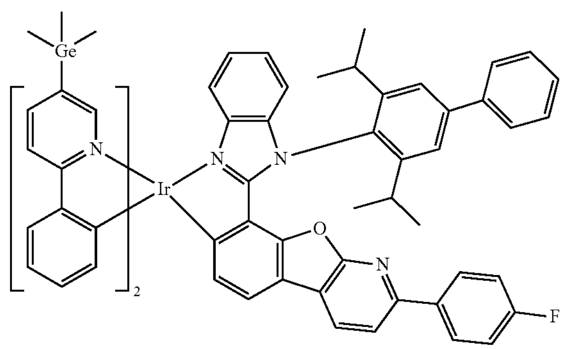
-continued
3427
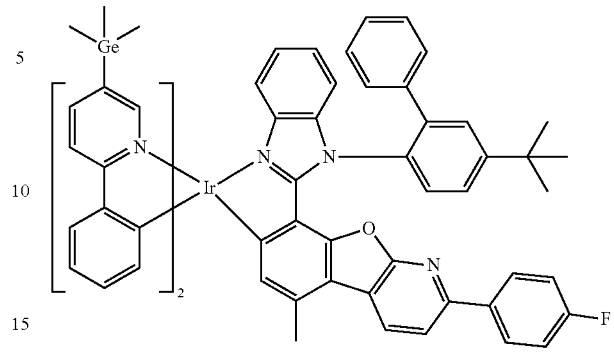
3428
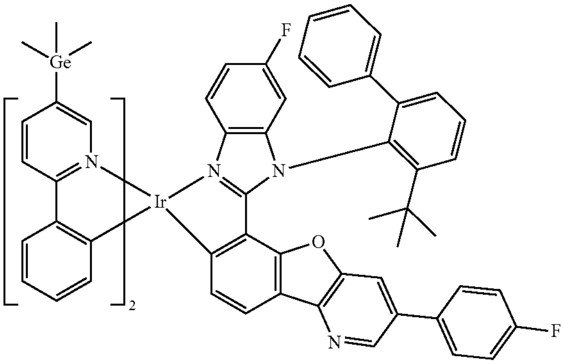
3429
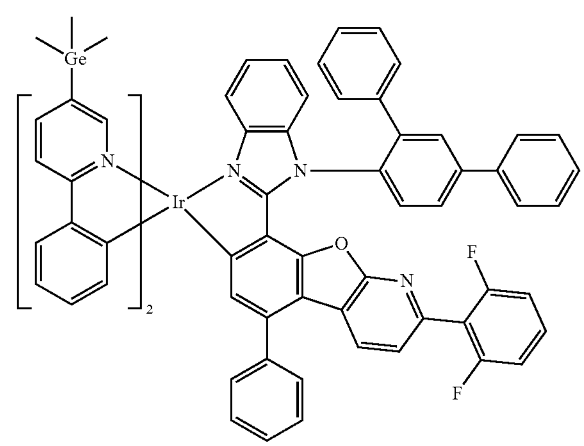

-continued
3430
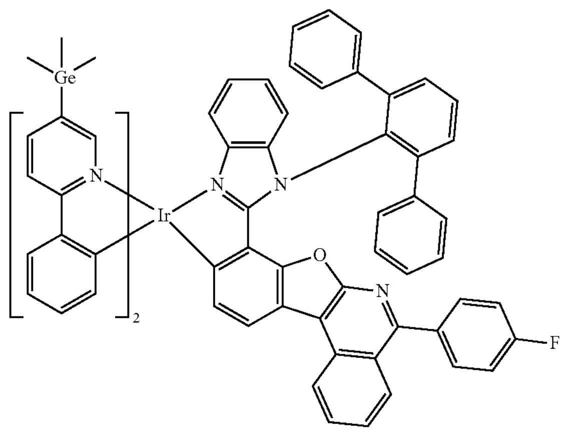
3431
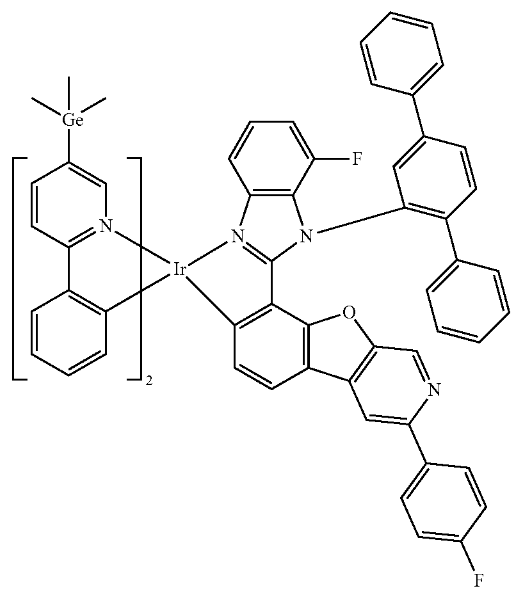
3432
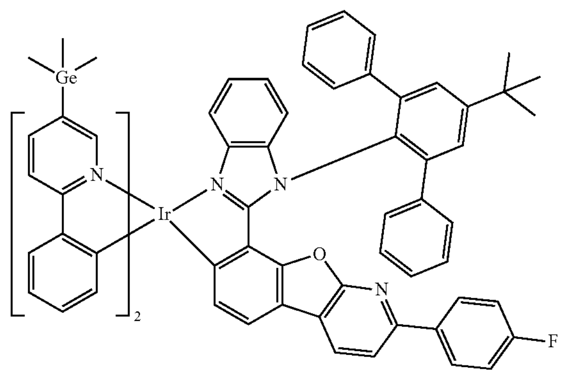
-continued
3433
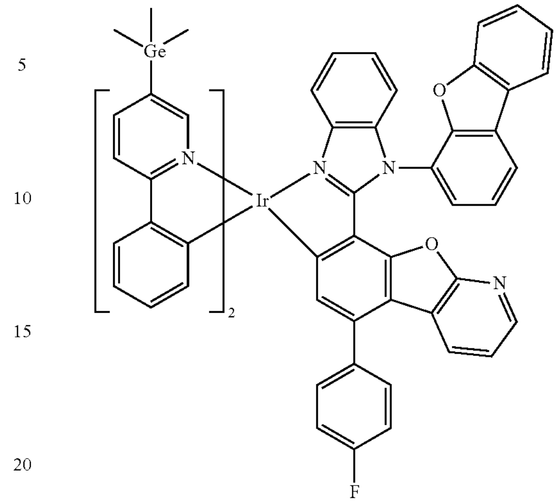
3434
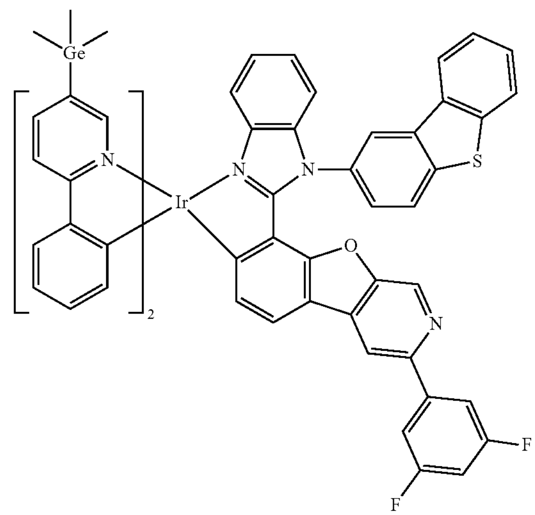
3435
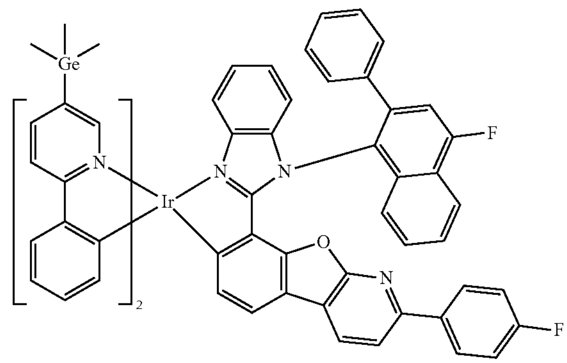

-continued
3436
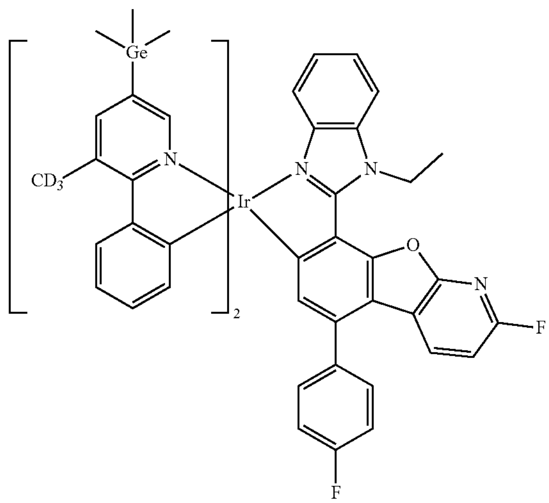
3437
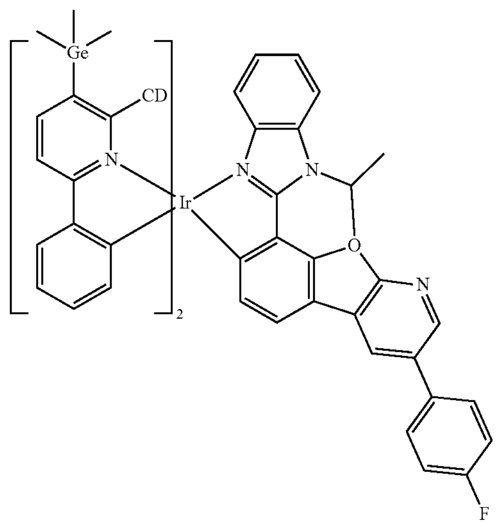
3438
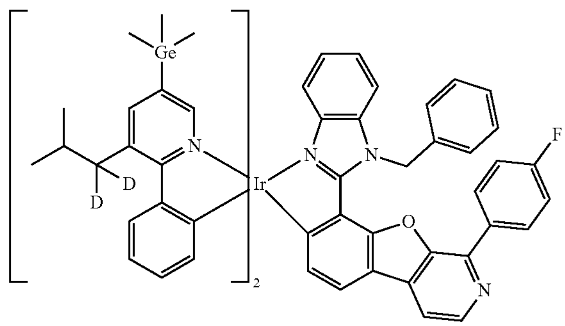
-continued
3439
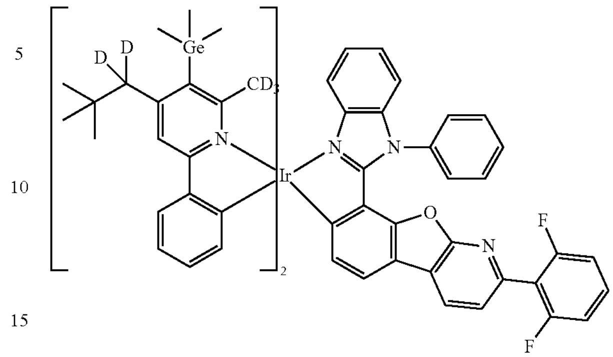
3440
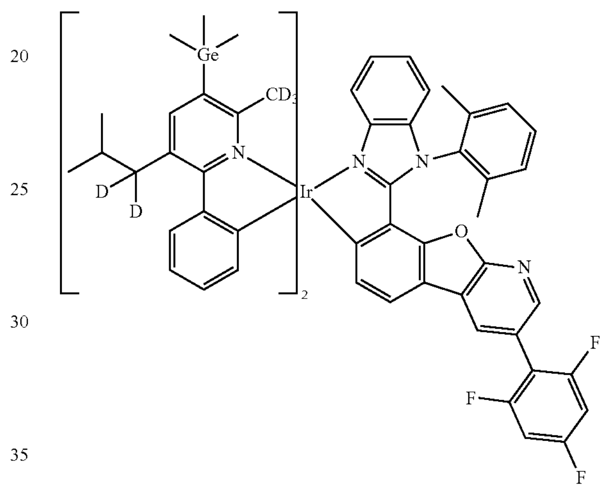
3441
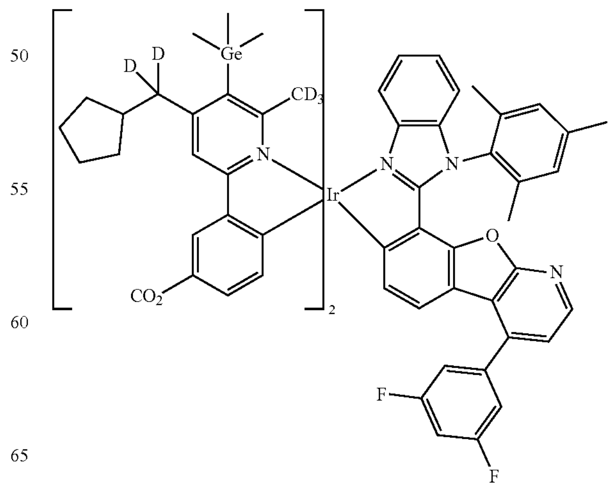

-continued
3442
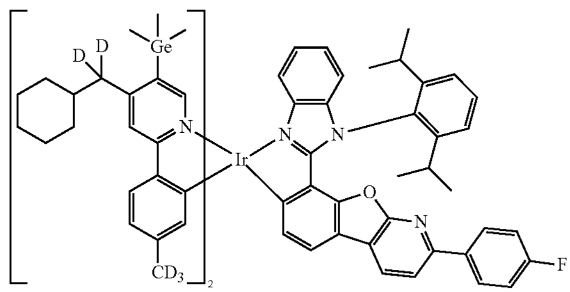
3443
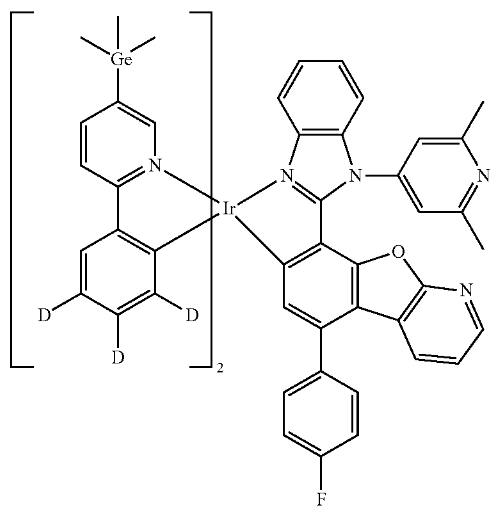
3444
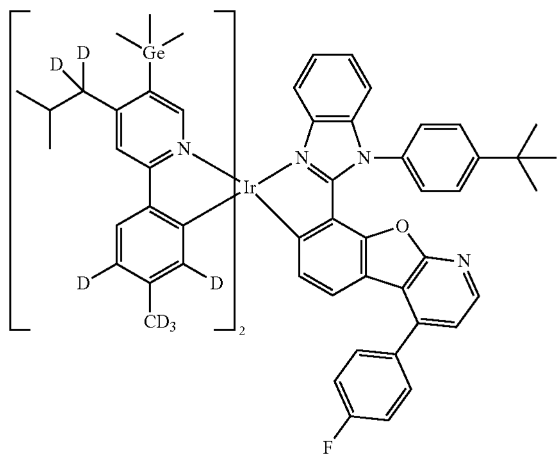
-continued
3445
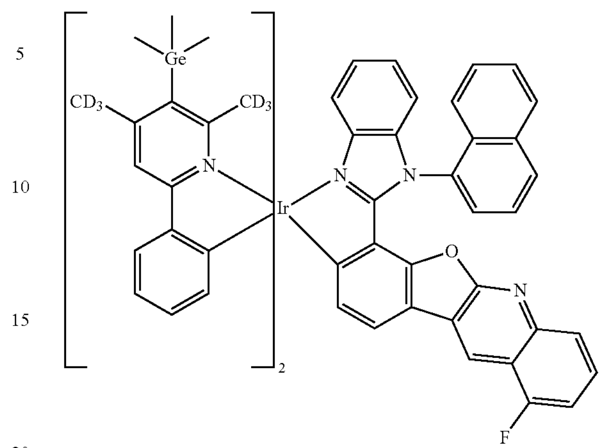
3446
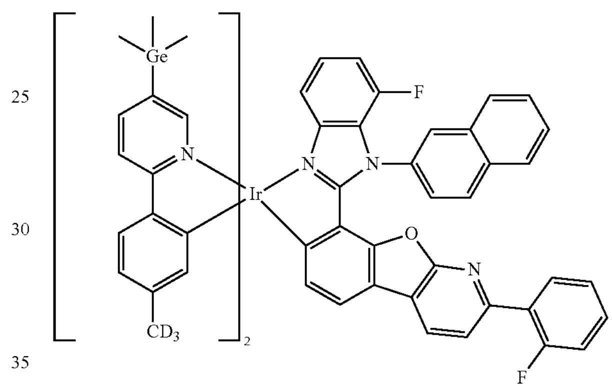
3447
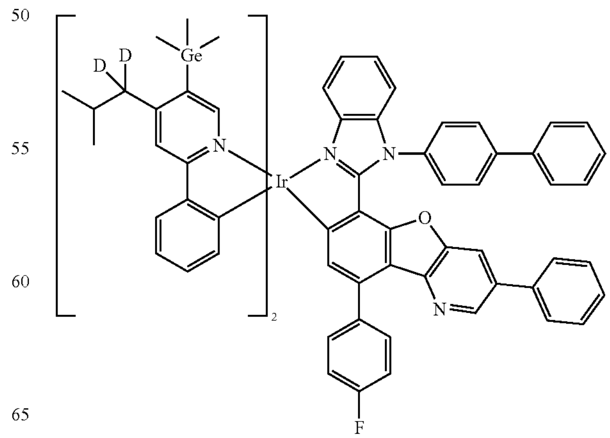

-continued
3448
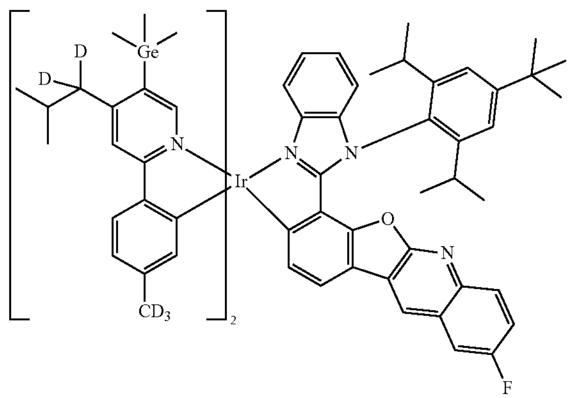
3449
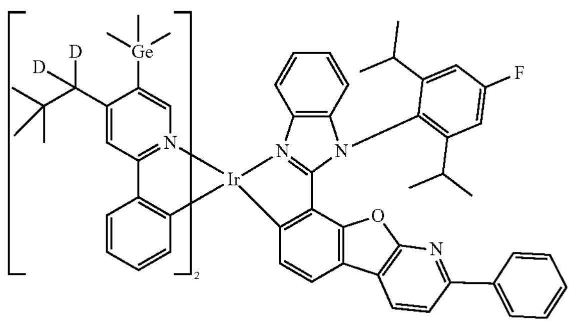
3450
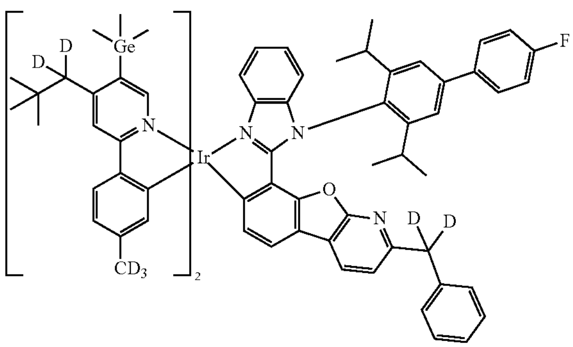
3451
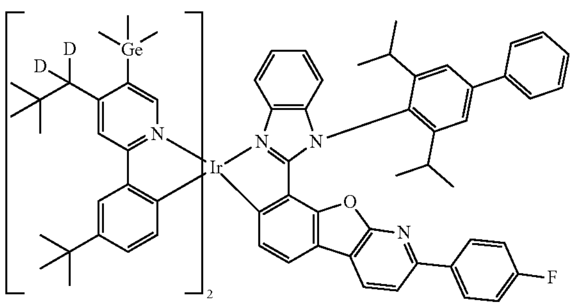
-continued
3452
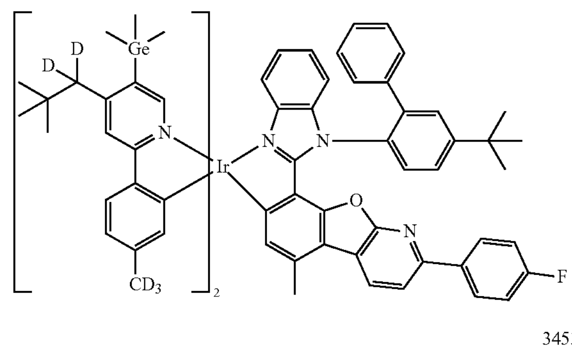
3453
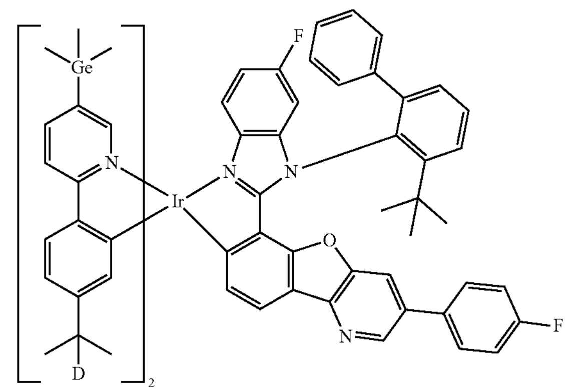
3454
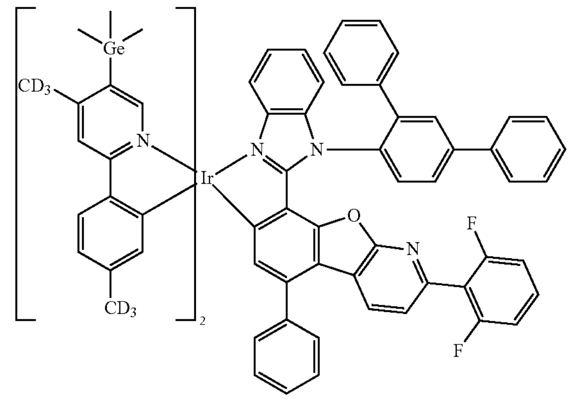
3455
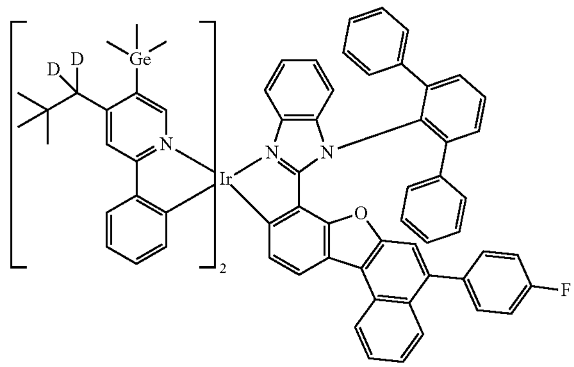

-continued
3456
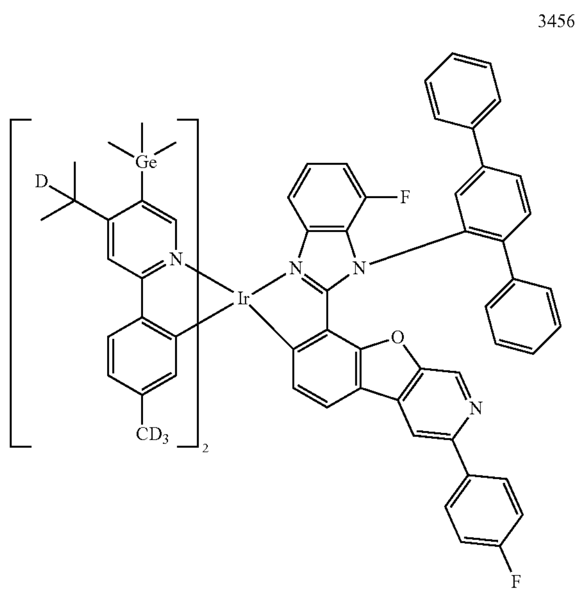
3457
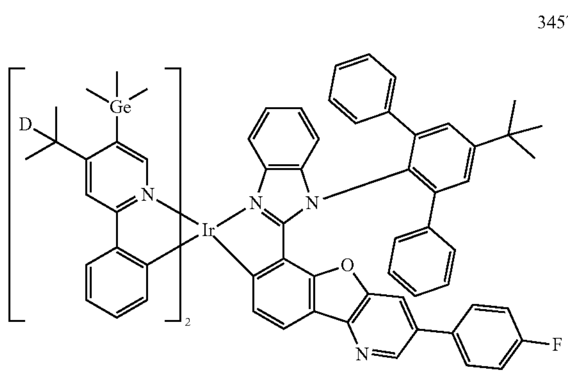
3458
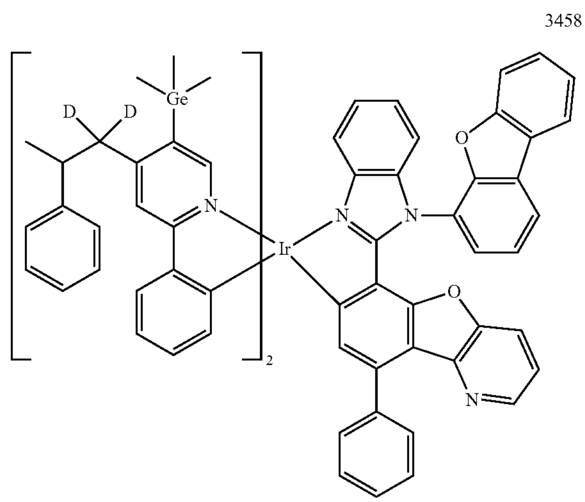
-continued
3459
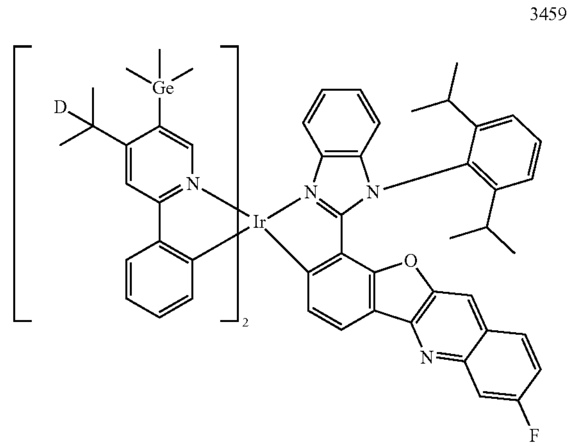
3460
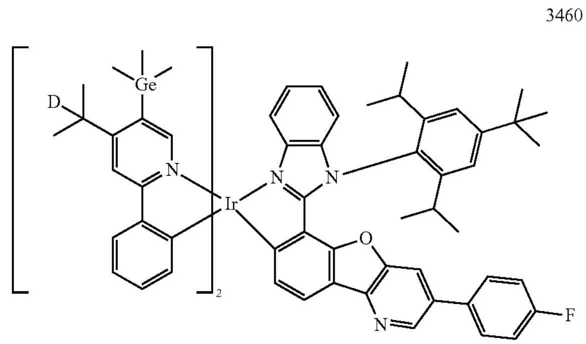
3461
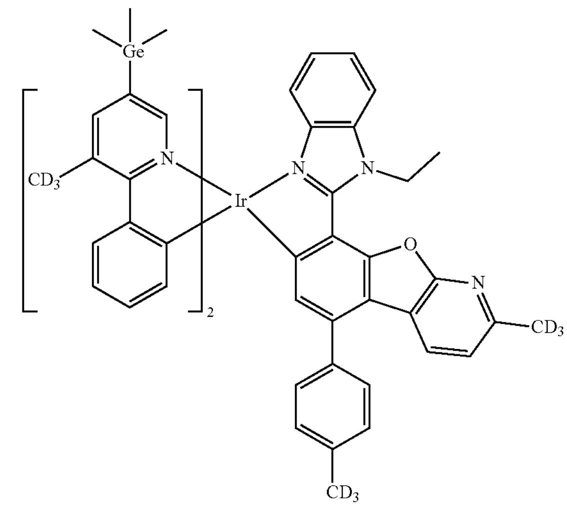

-continued
3462
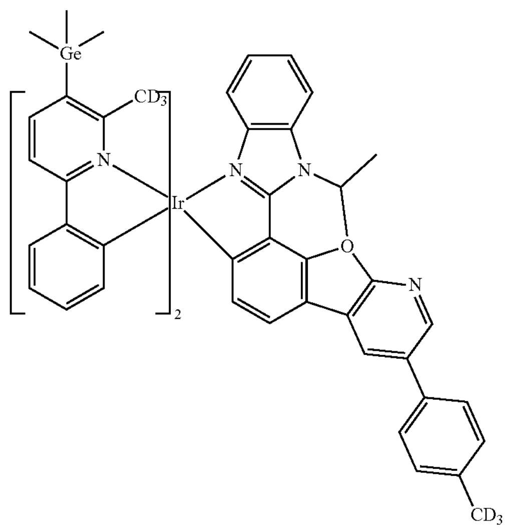
3463
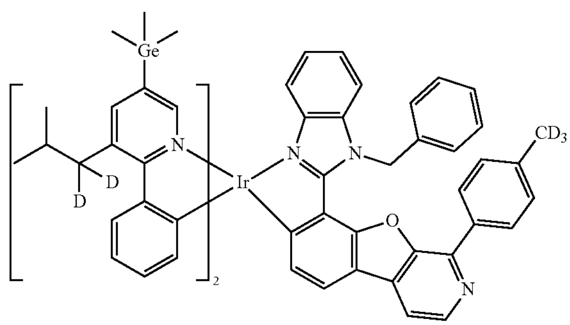
3464
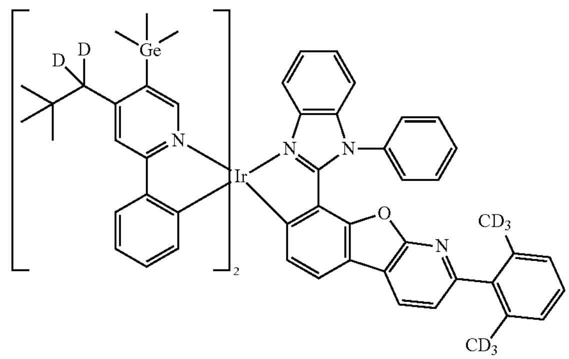
-continued
3465
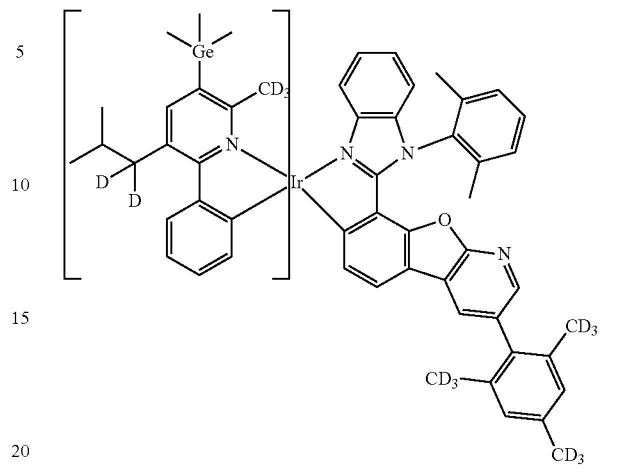
3466
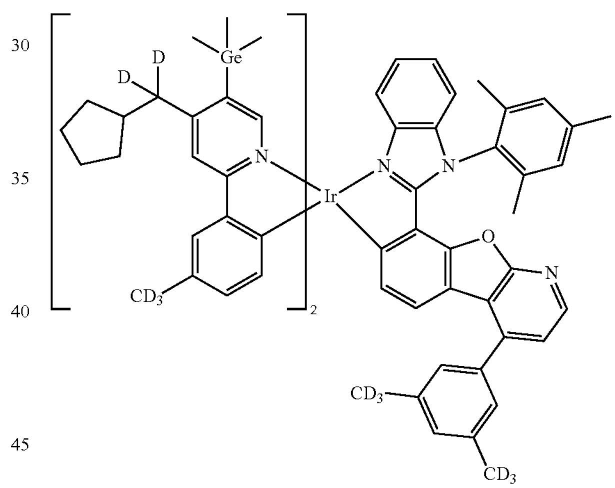
3467
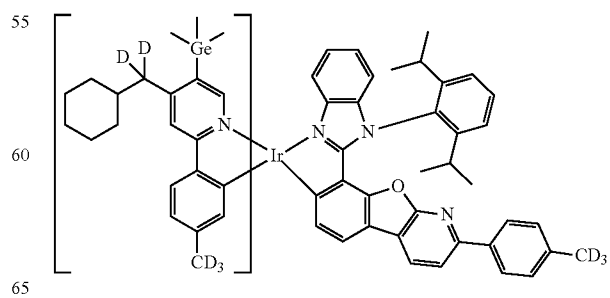

-continued
3468
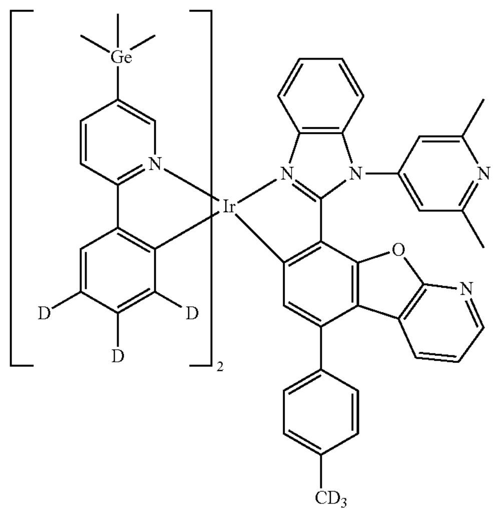
3469
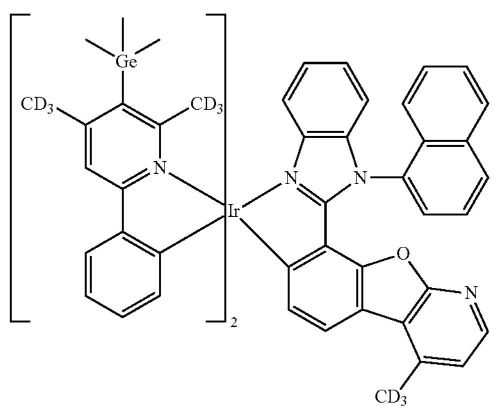
3470
-continued
3471
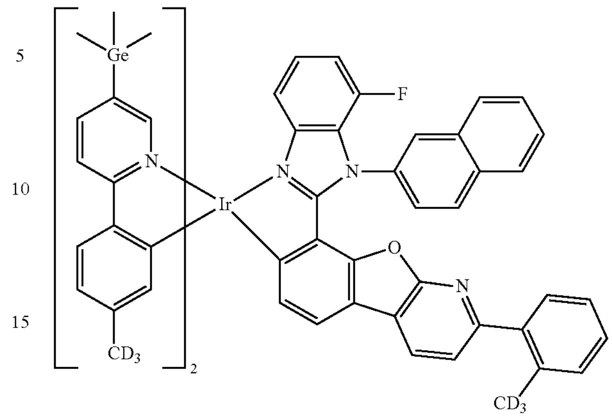
3472
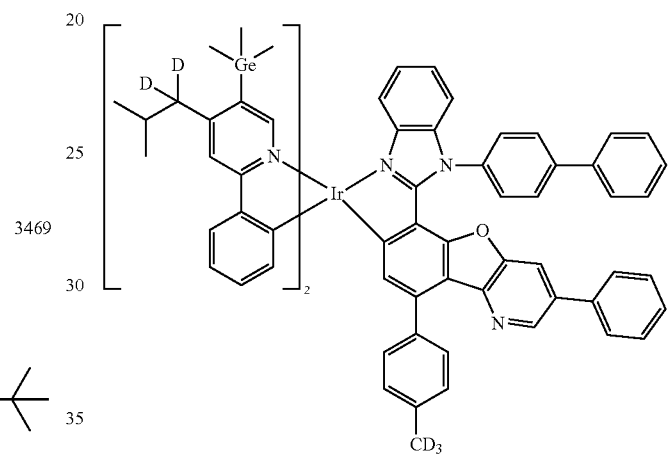
3473
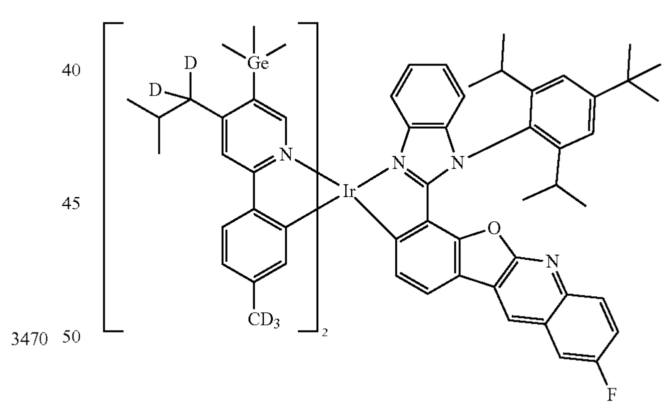
3474
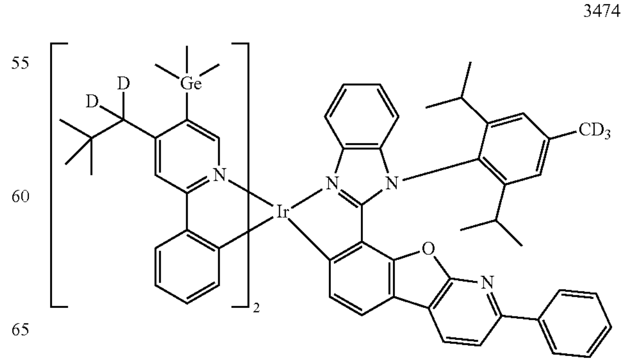

-continued
3475
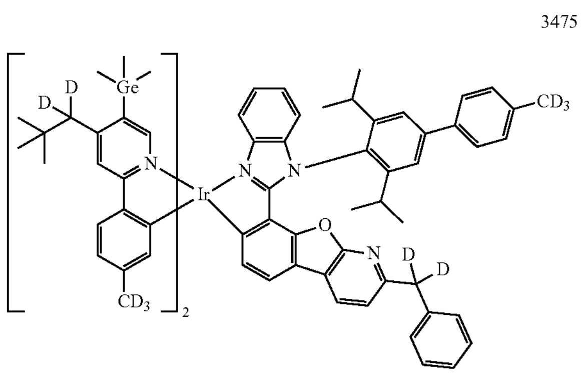
3476
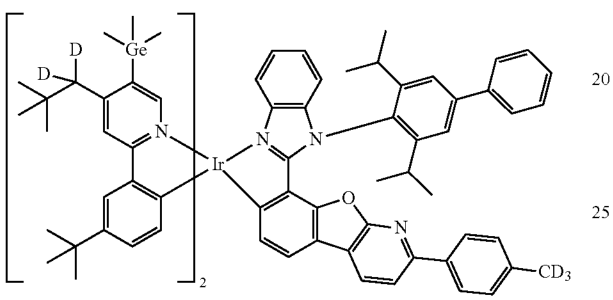
3477
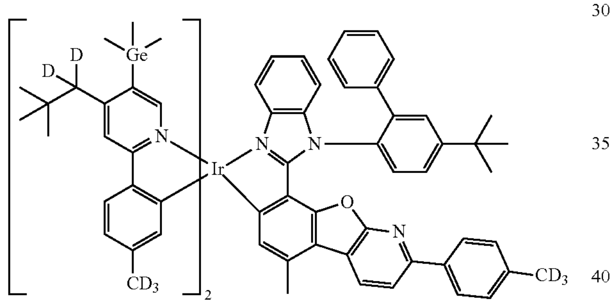
3478
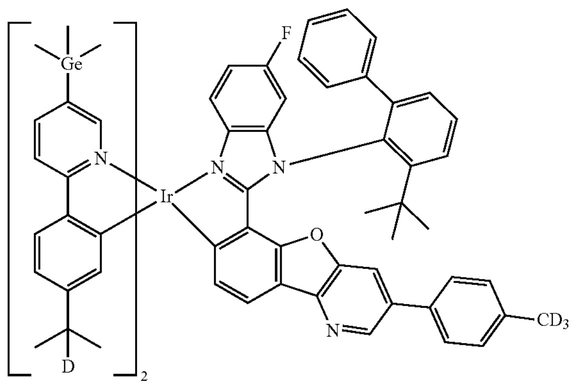
-continued
3479
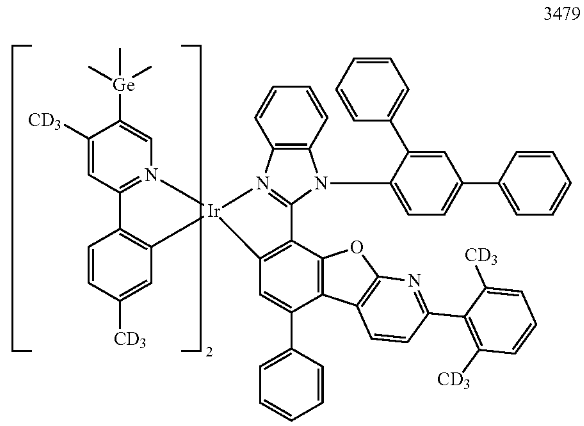
3480
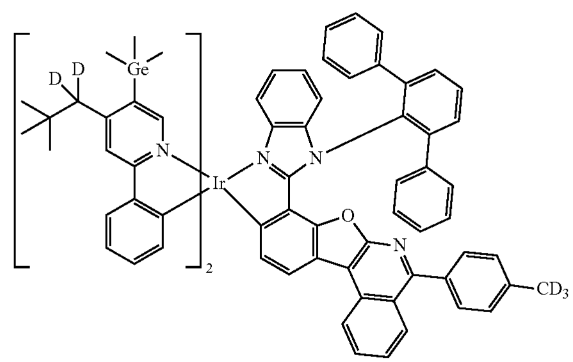
3481
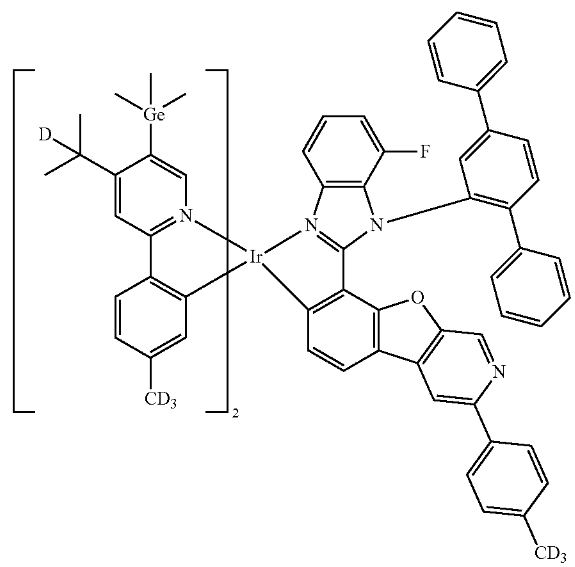

-continued
3482
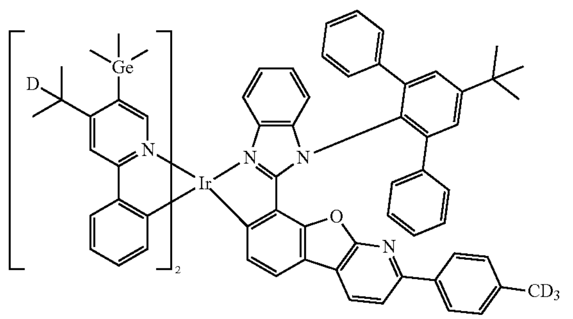
3483
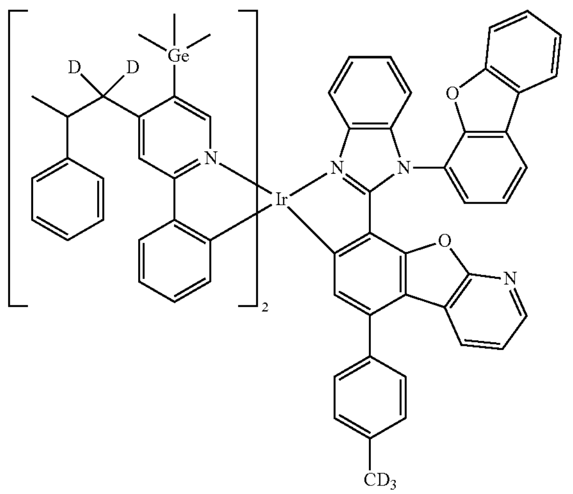
3484
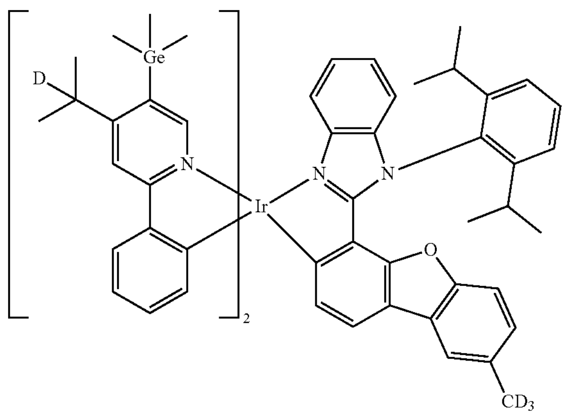
3485
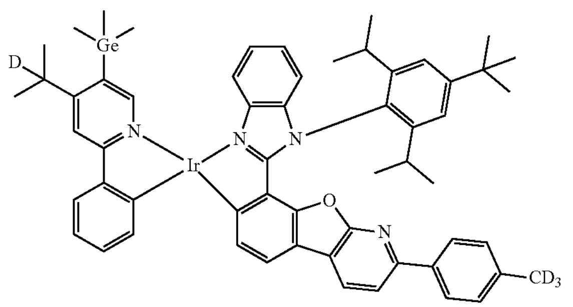
-continued
3486
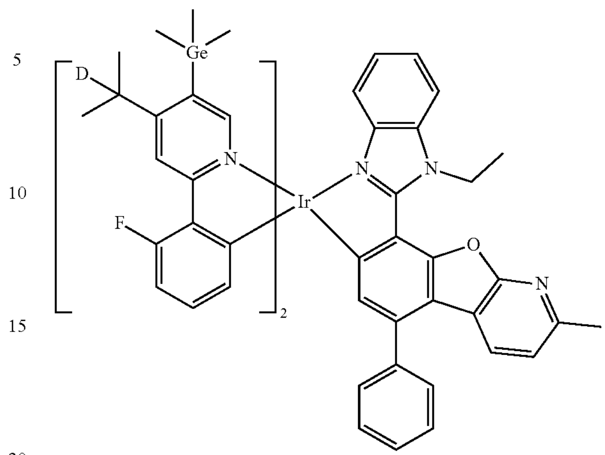
3487
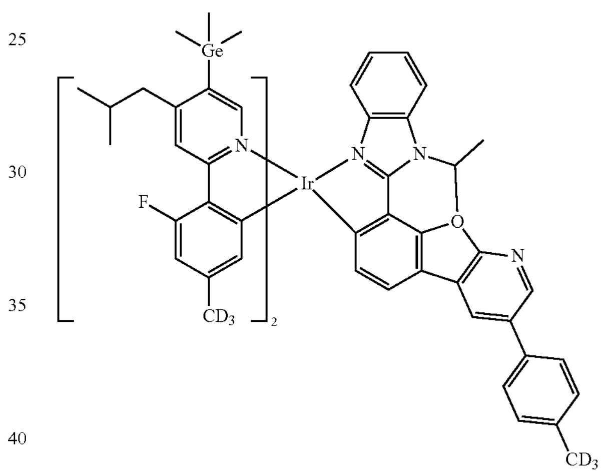
3488
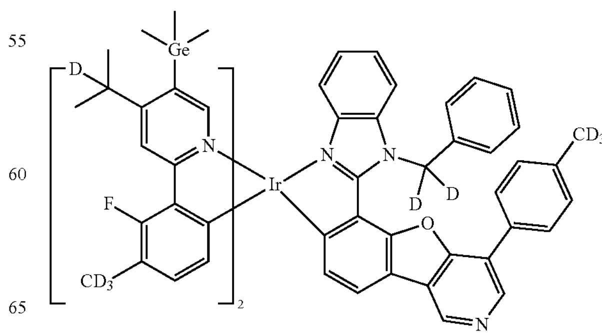

-continued
3489
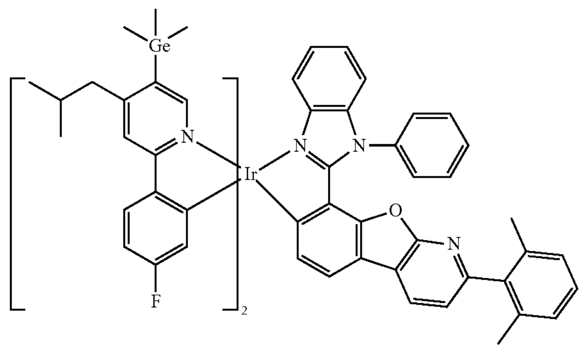
3490
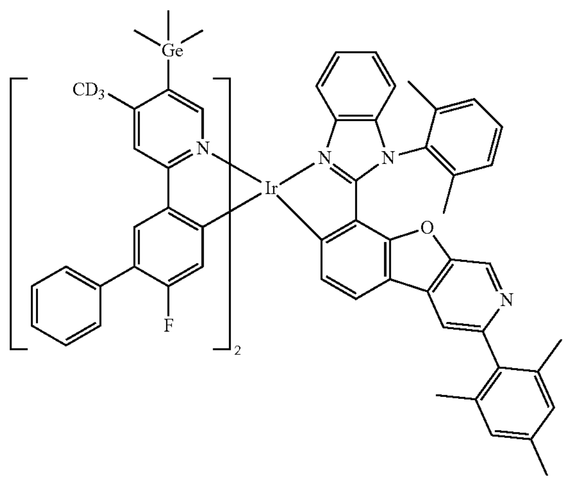
3491
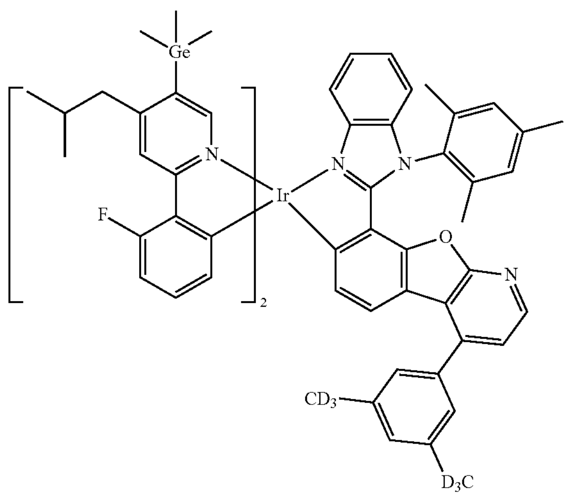
-continued
3492
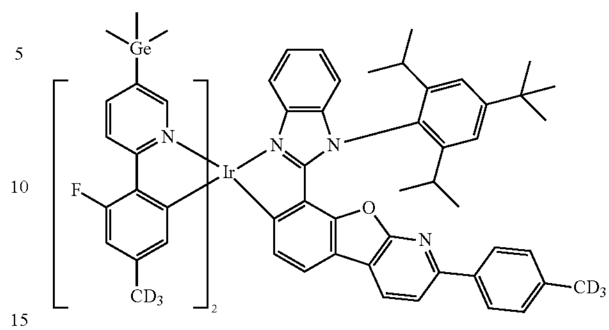
3493
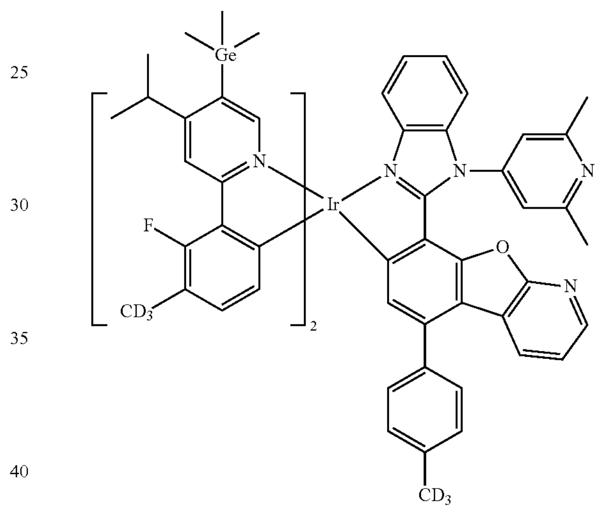
3494
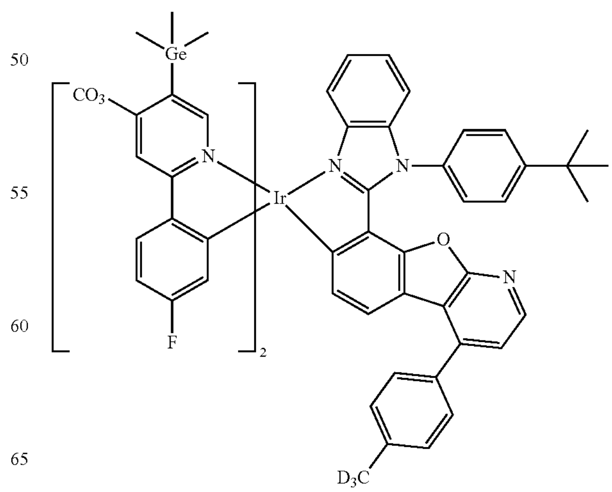

-continued
3495
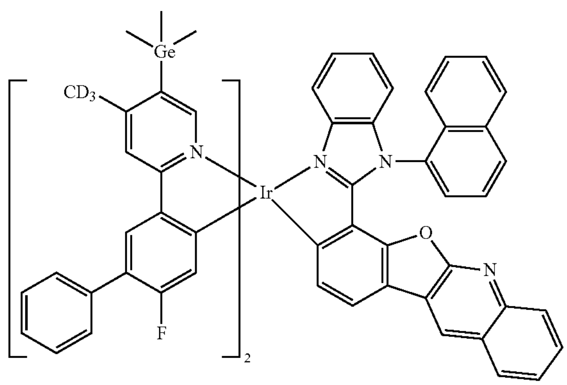
3496
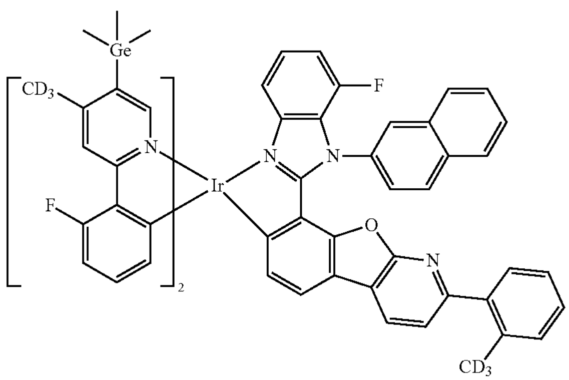
3497
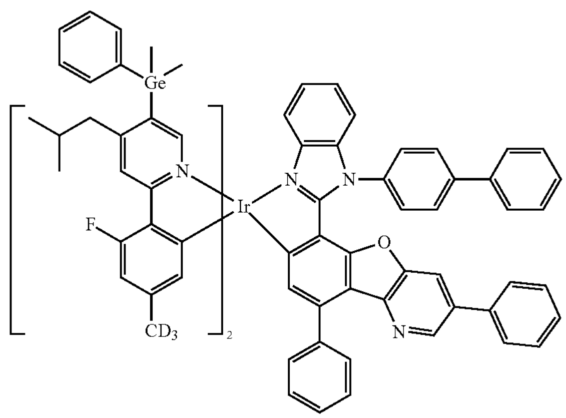
-continued
3498
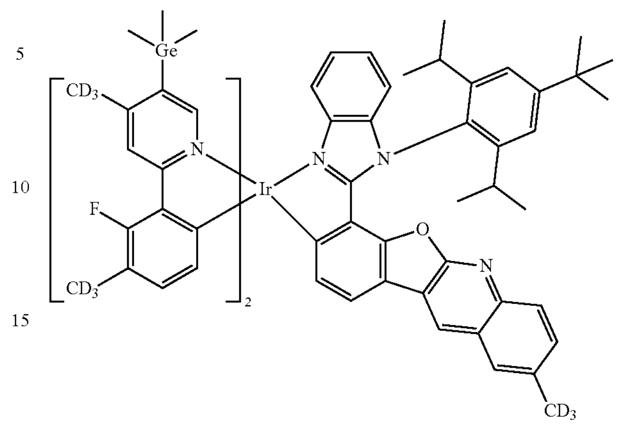
3499
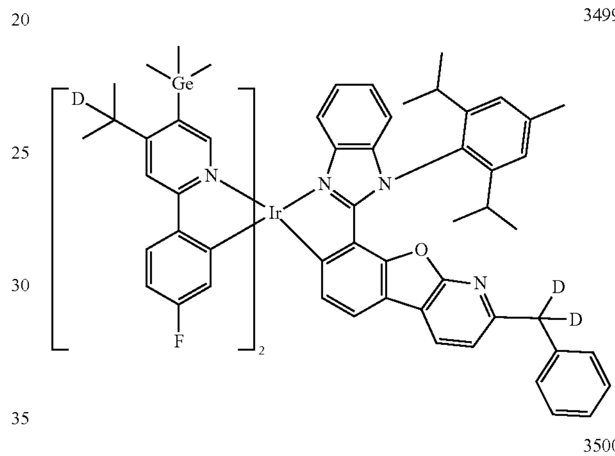
3500
3501
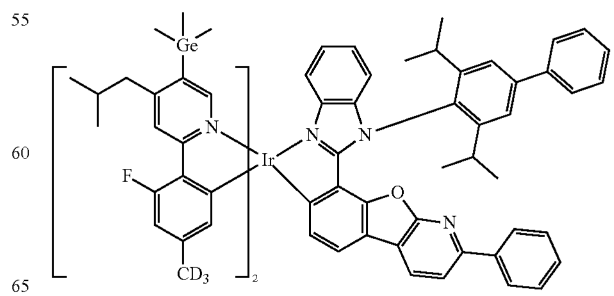

-continued
3502
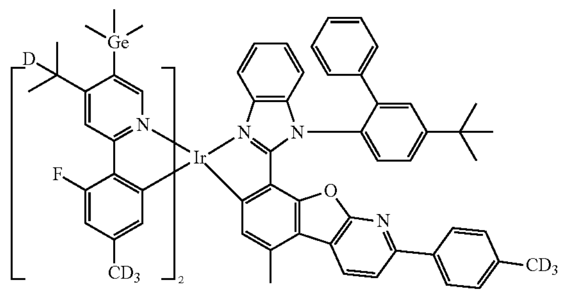
3503
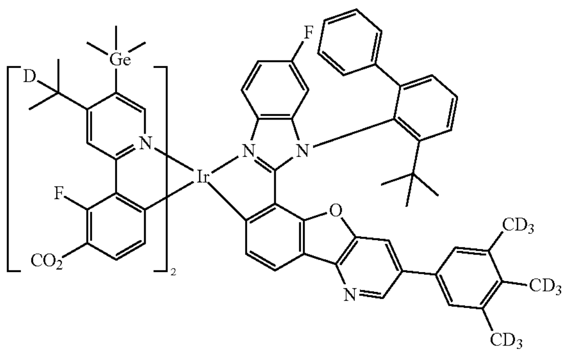
3504
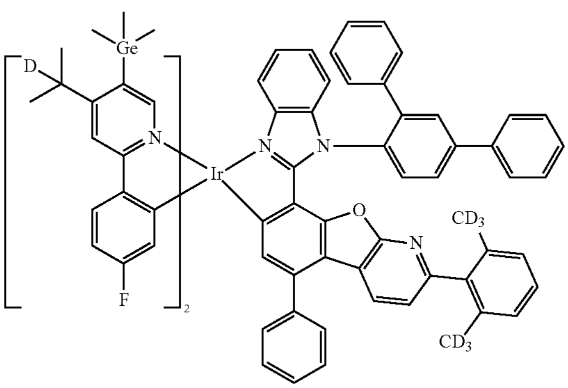
3505
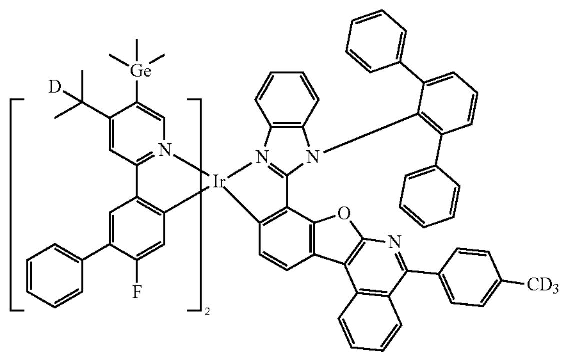
-continued
3506
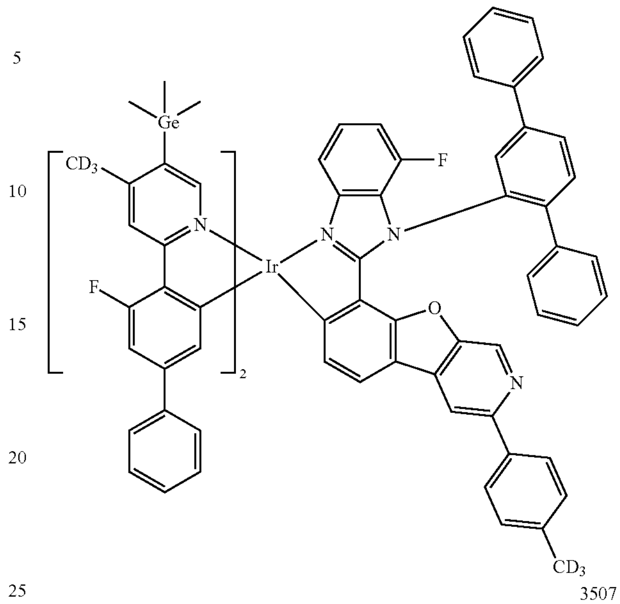
3507
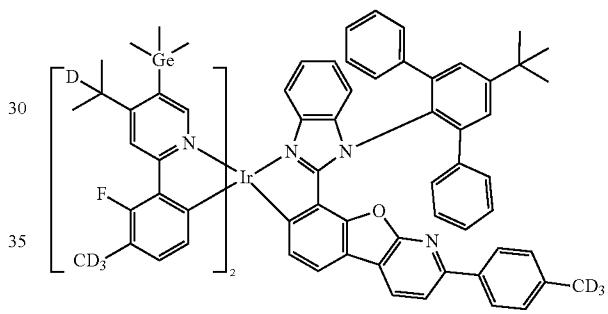
3508
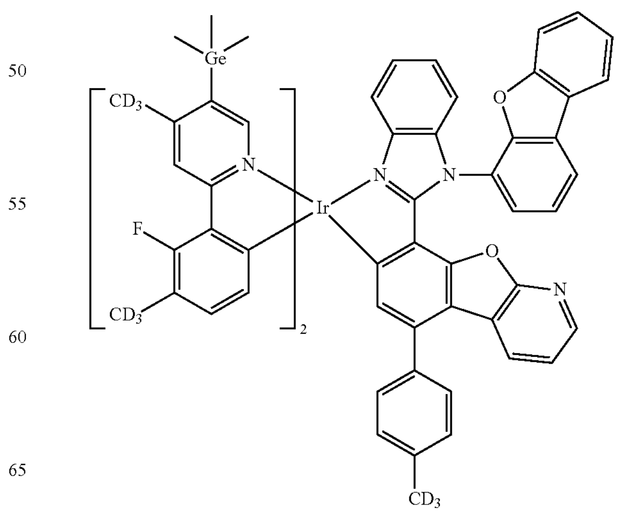

-continued
3509
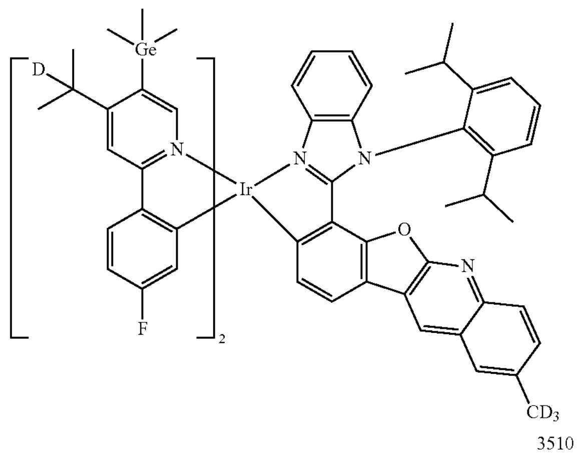
3510
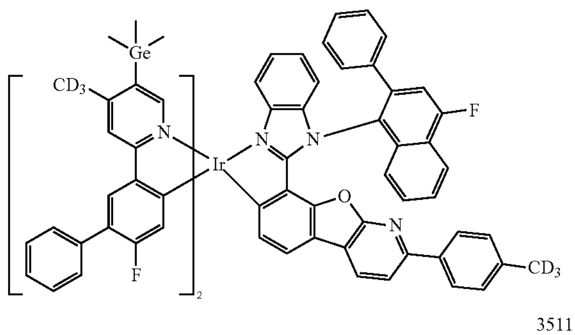
3511
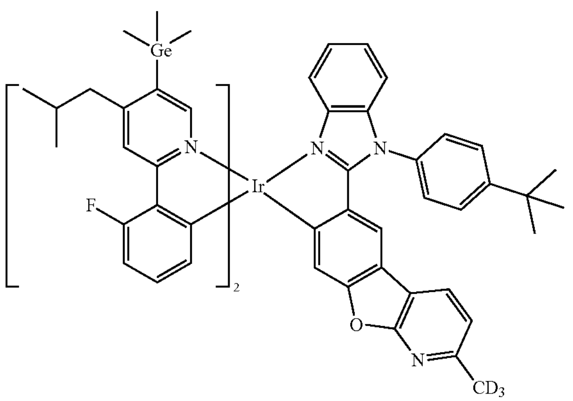
3512
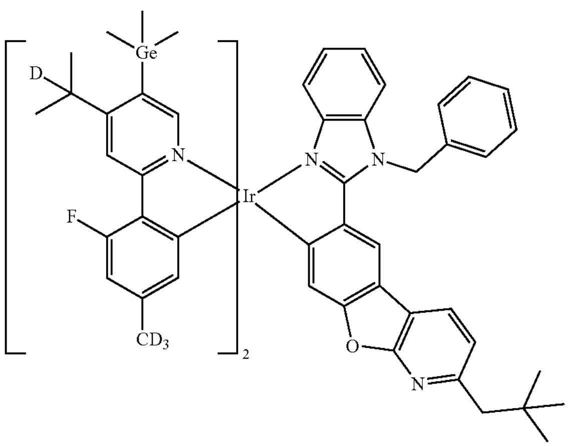
-continued
3513
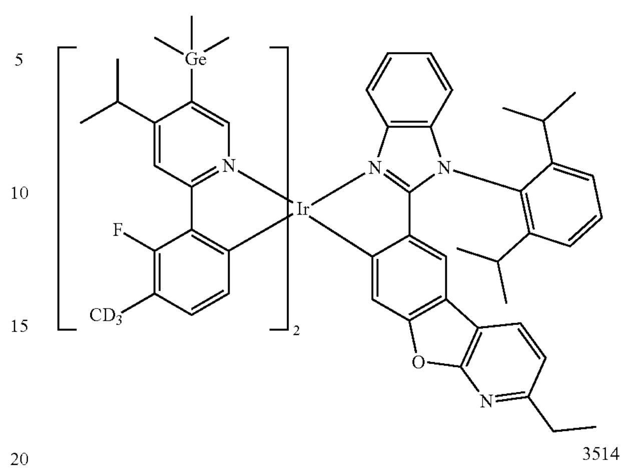
3514
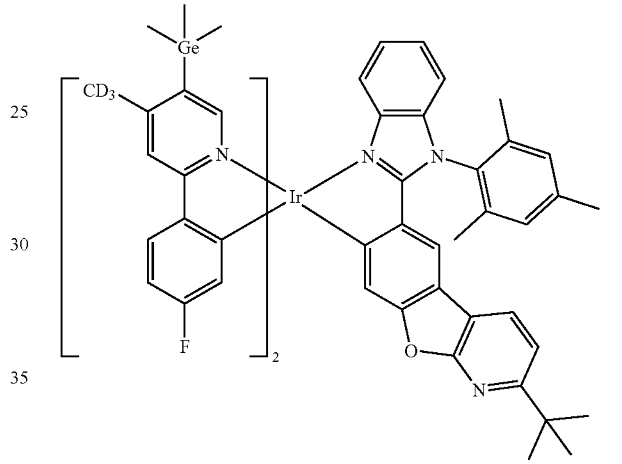
3515
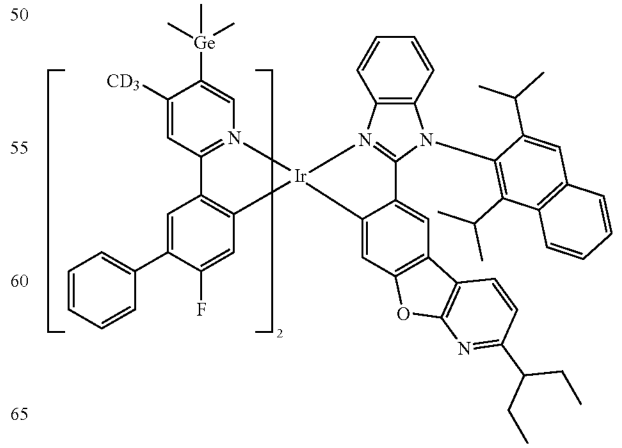

-continued
3516
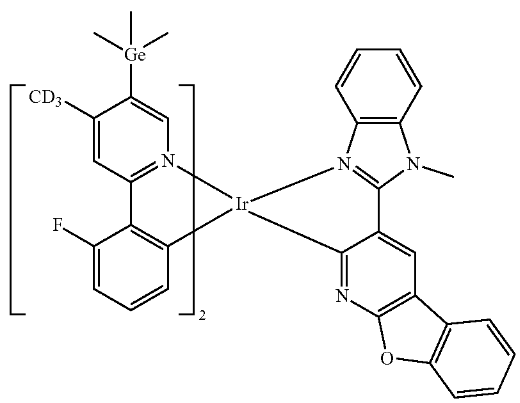
3517
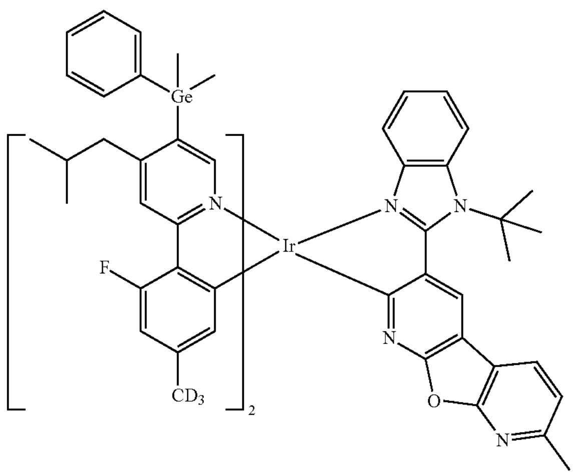
3518
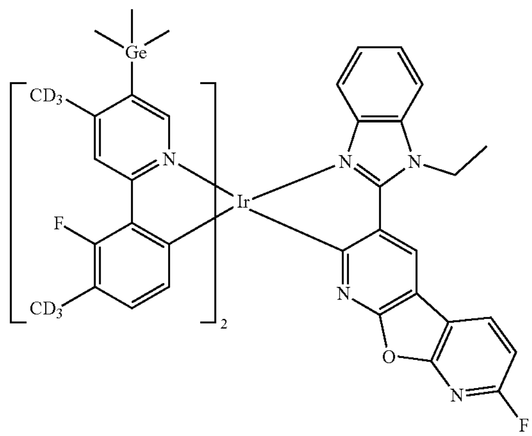
-continued
3519
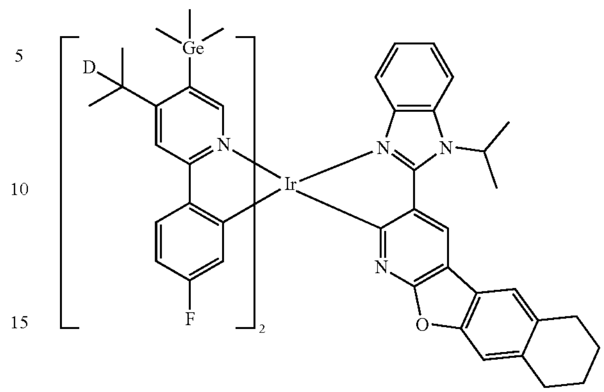
3520
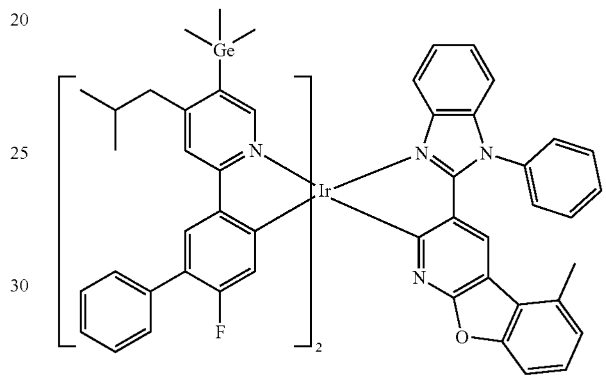
3521
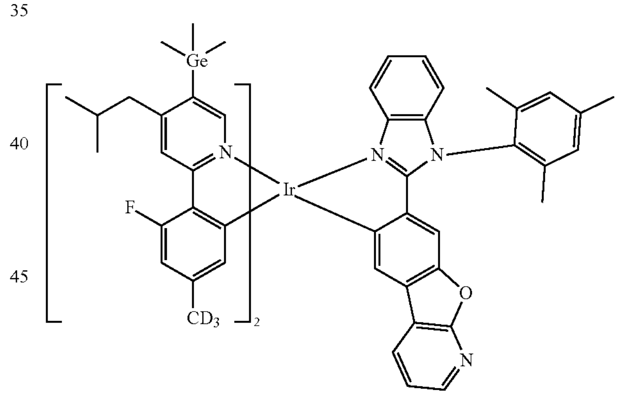
3522
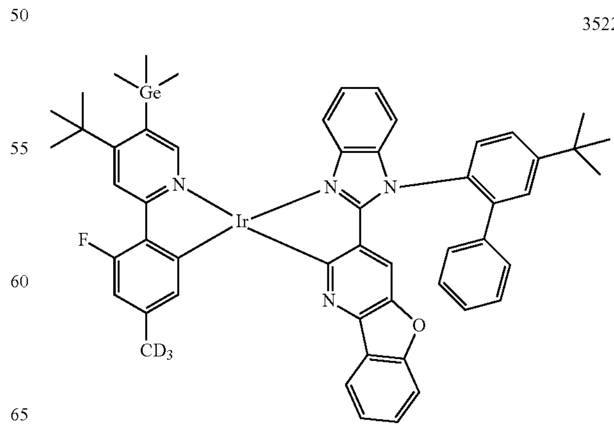

-continued
3523
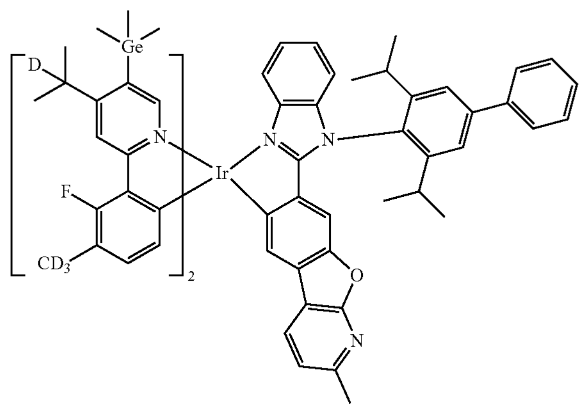
3524
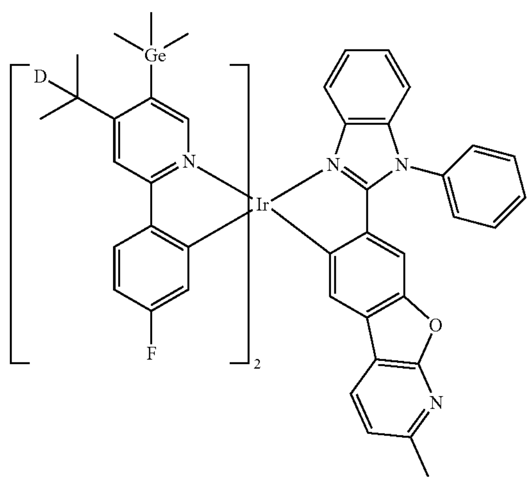
3525
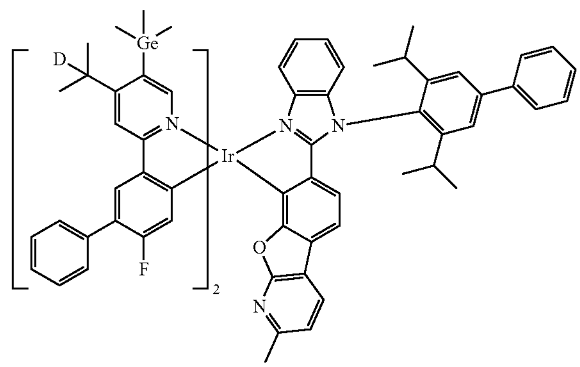
-continued
3526
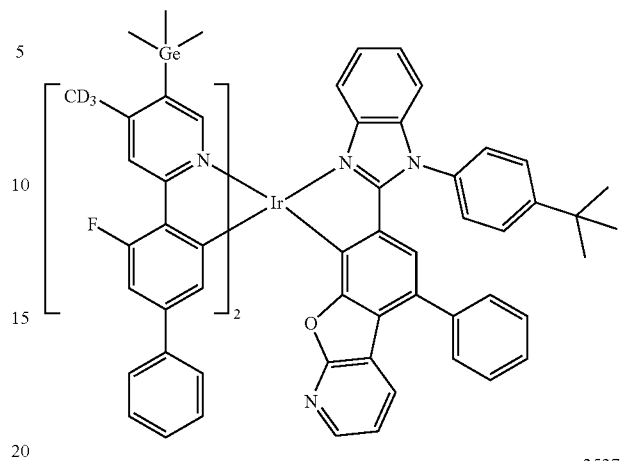
3527
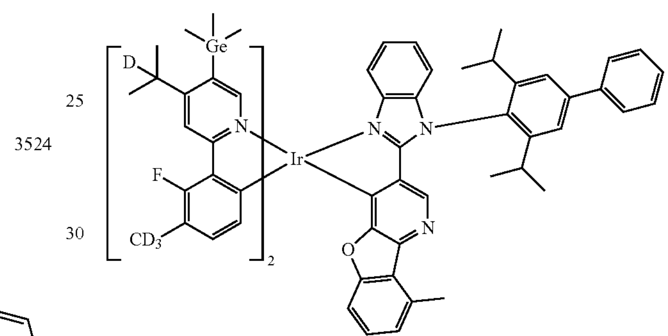
3528
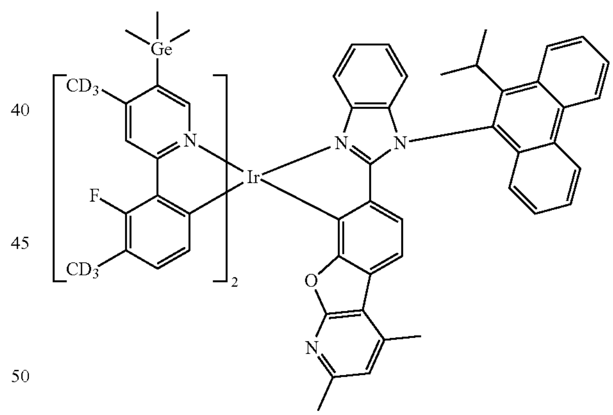
3529
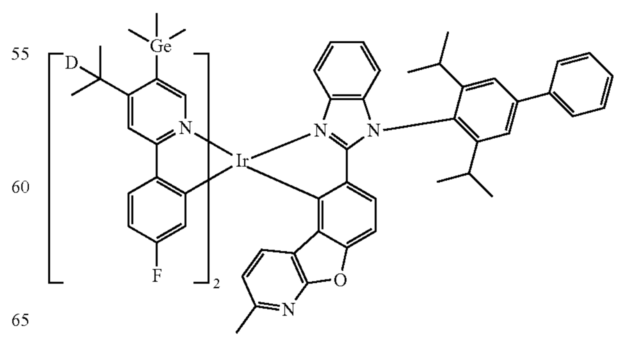

3530
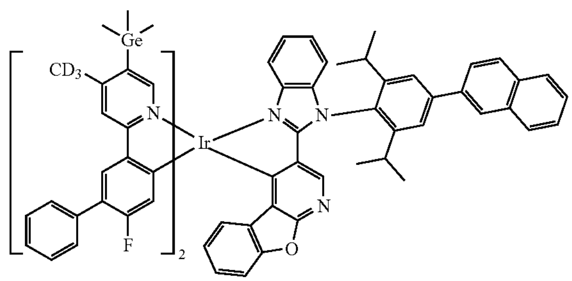
3531
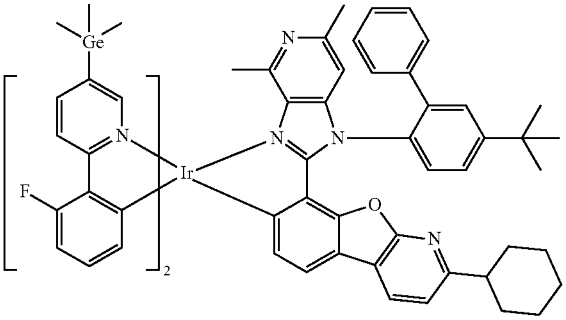
3532
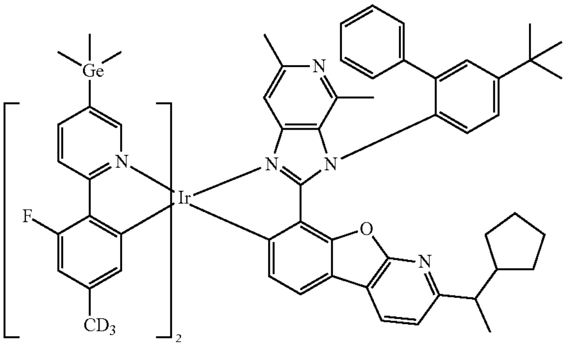
3533
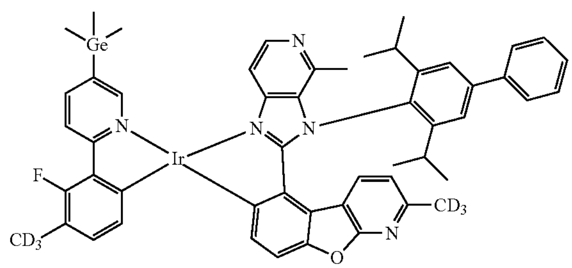
3534
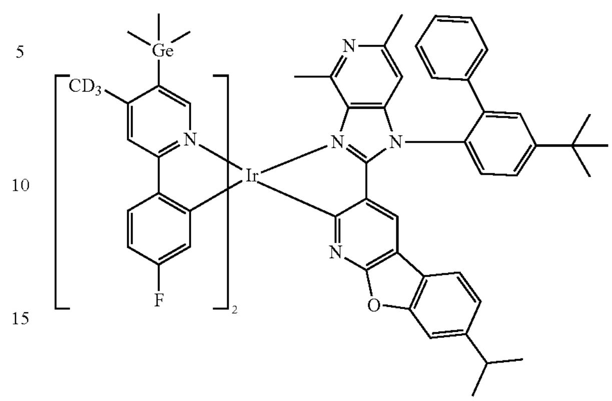
3535
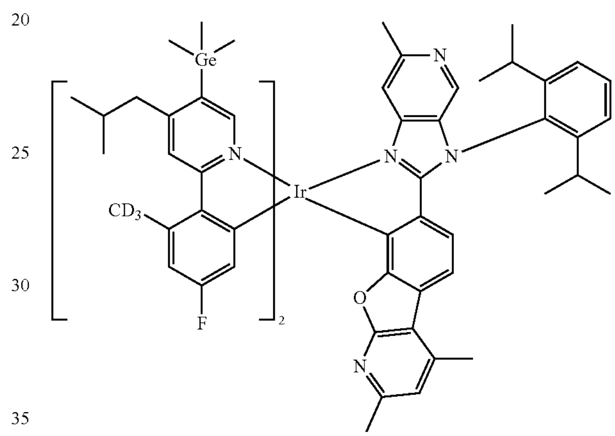
3536
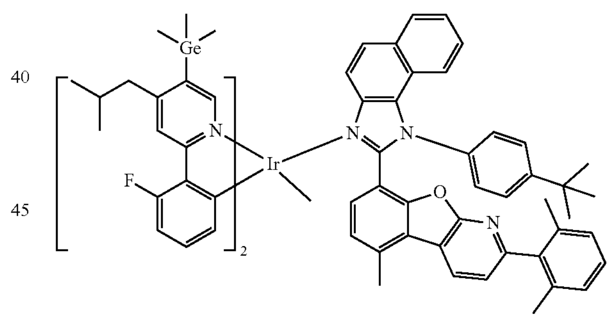
3537
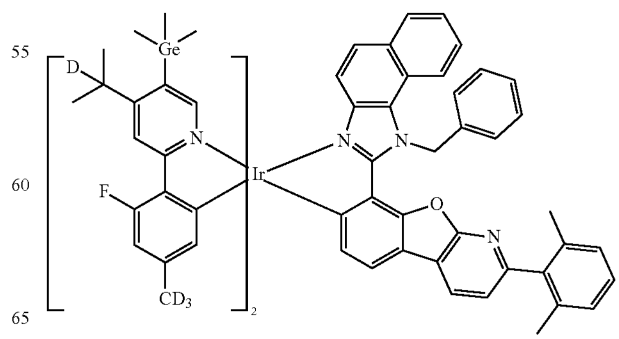

-continued
3538
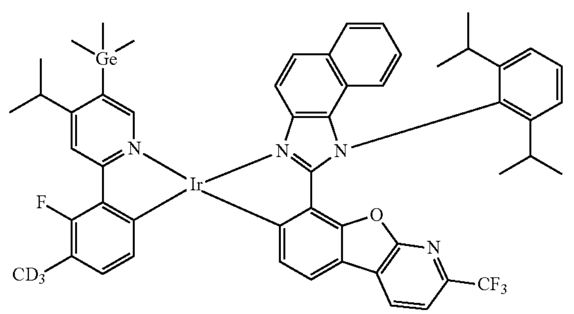
3539
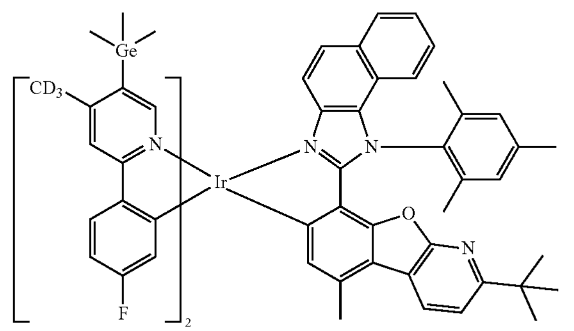
3540
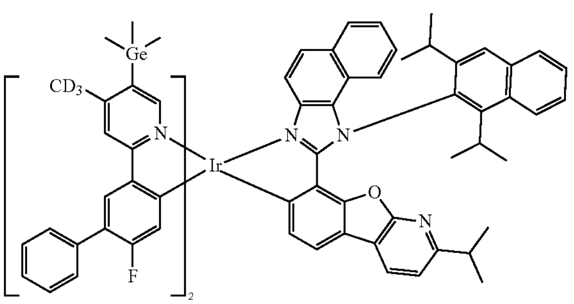
3541
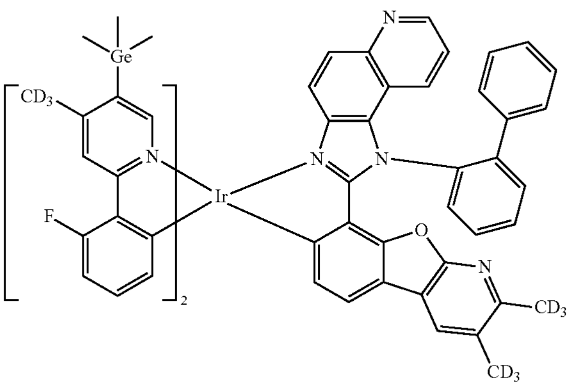
-continued
3542
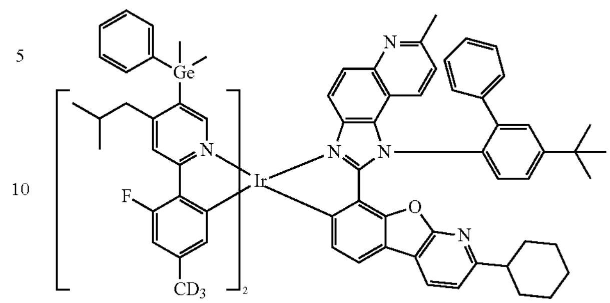
3543
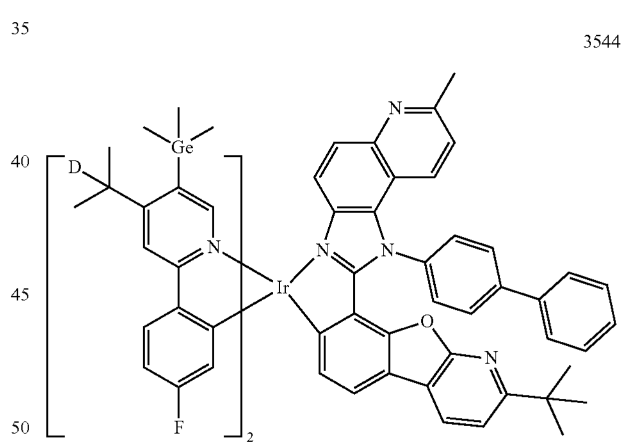
3544
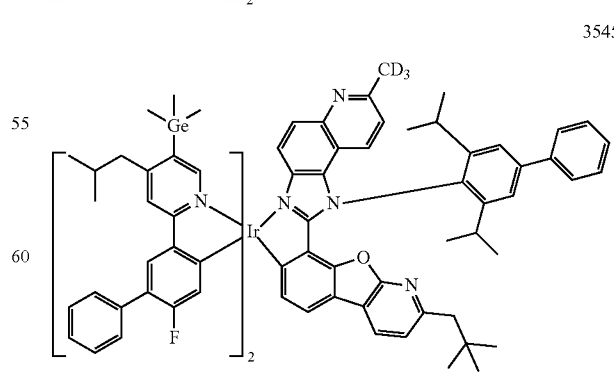
3545

-continued
3546
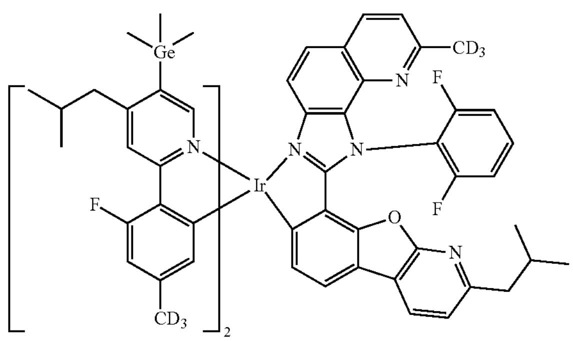
3547
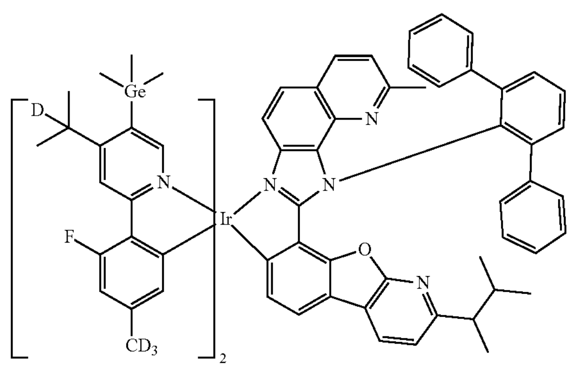
3548
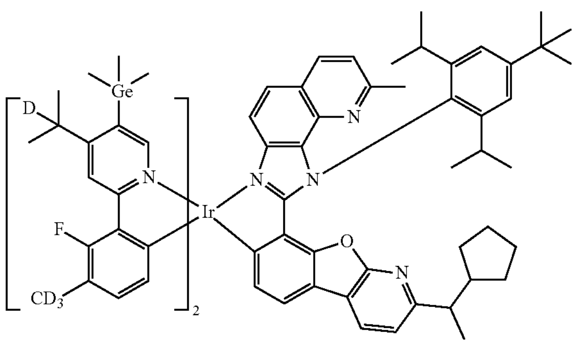
3549
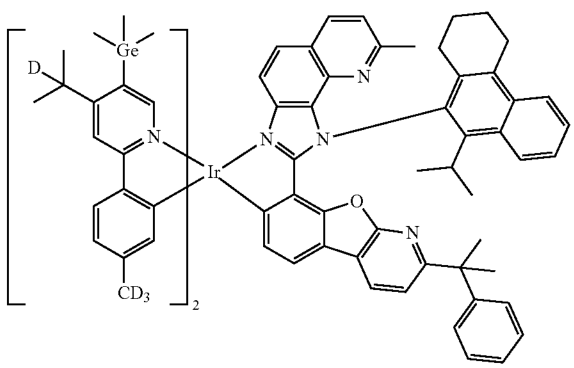
-continued
3550
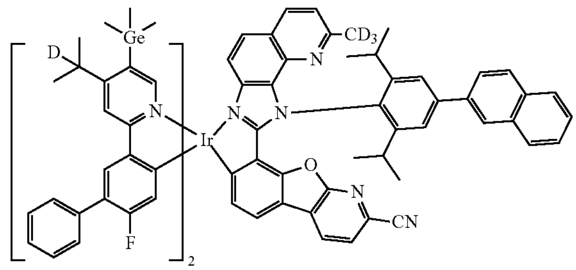
3551
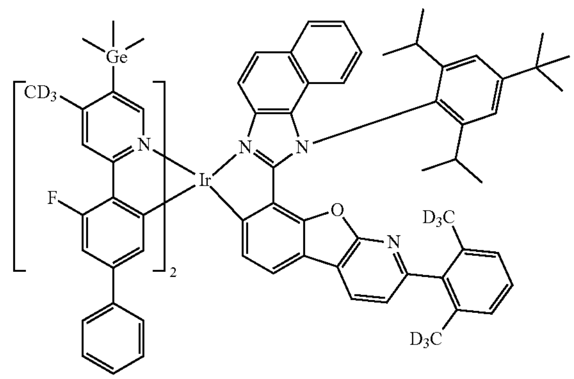
3552
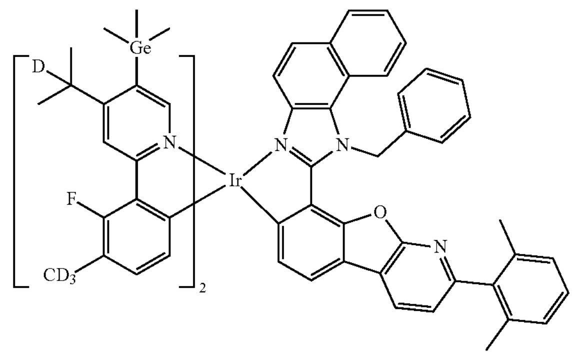
3553
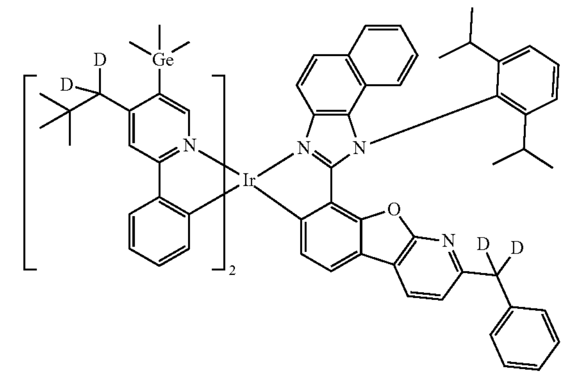

-continued
3554
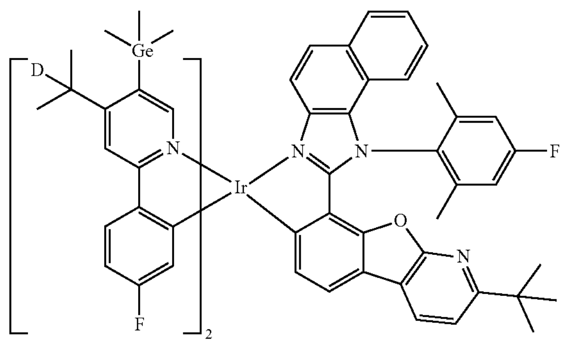
3555
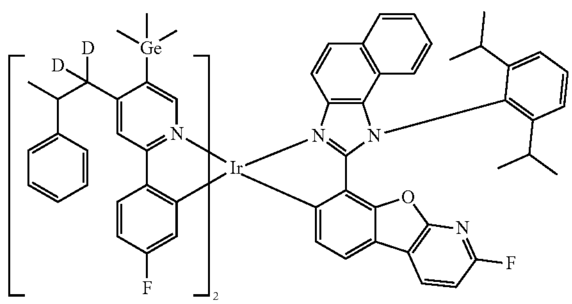
3556
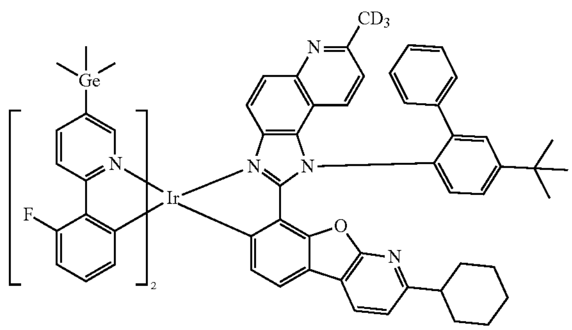
3557
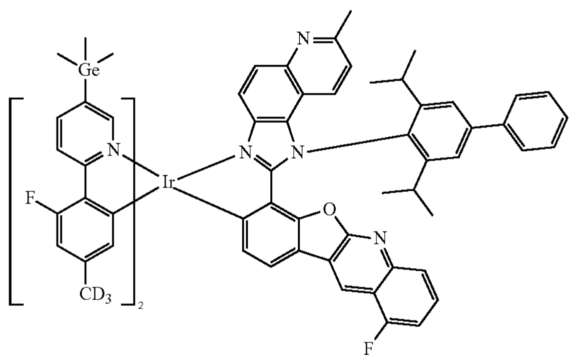
-continued
3558
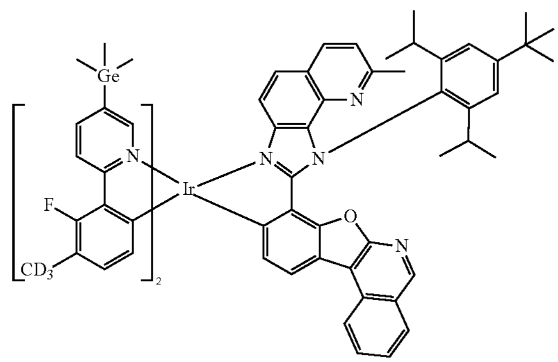
3559
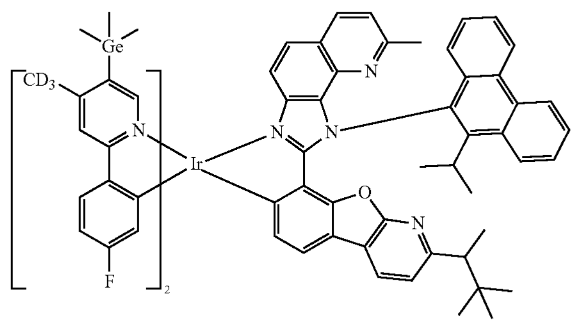
3560
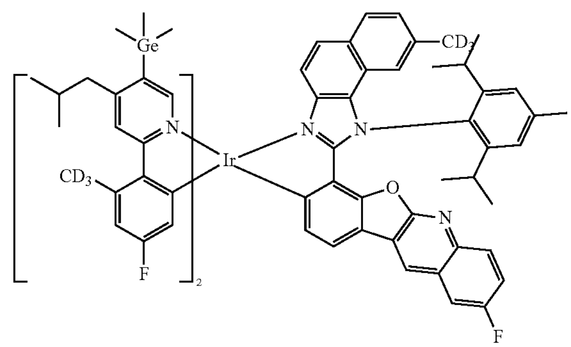
3561
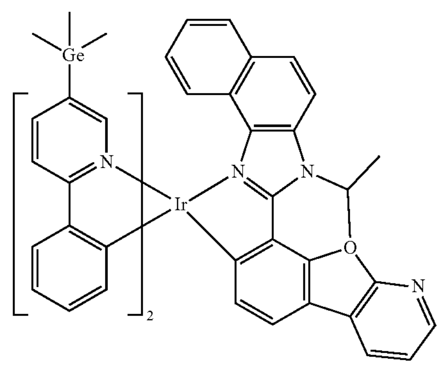

-continued
3562
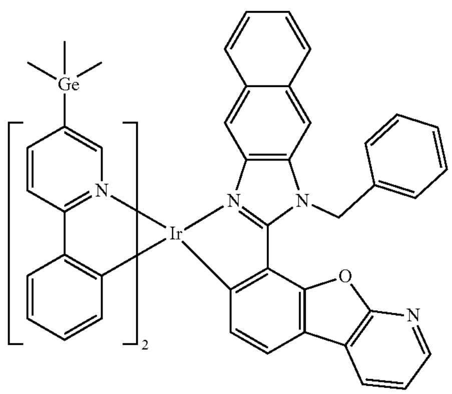
3563
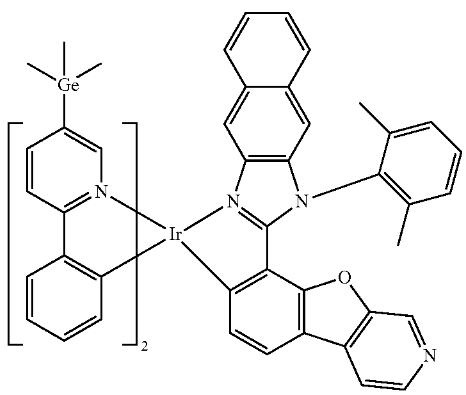
3564
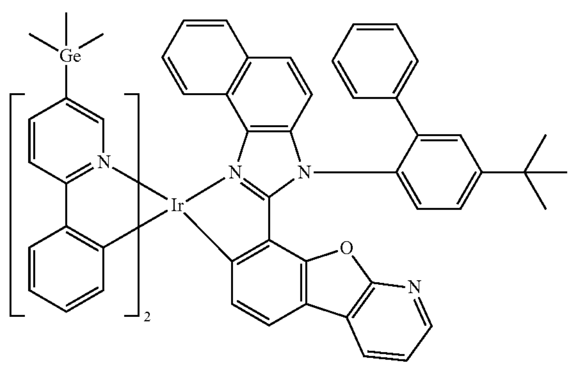
3565
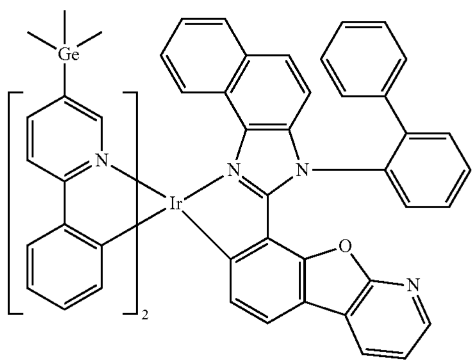
-continued
3566
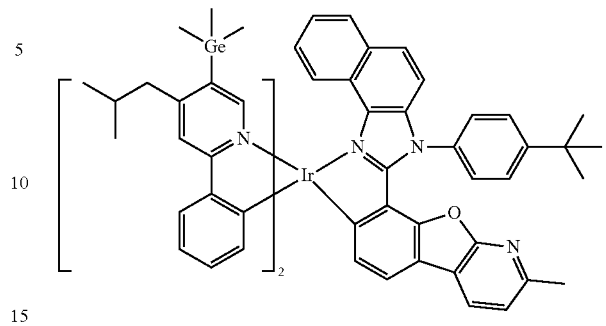
3567
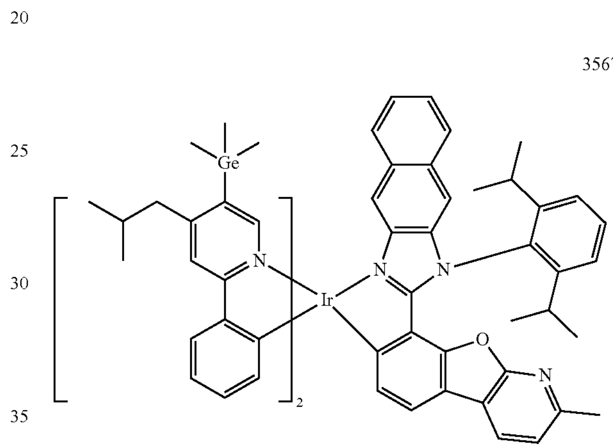
3568
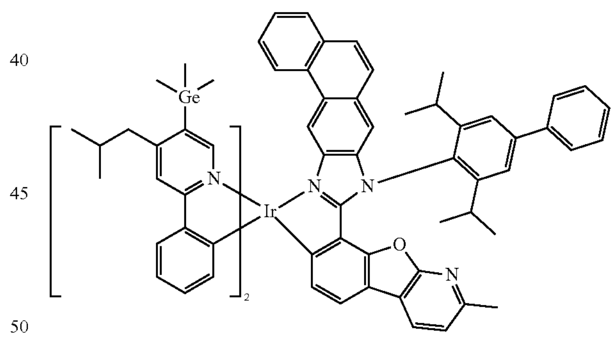
3569
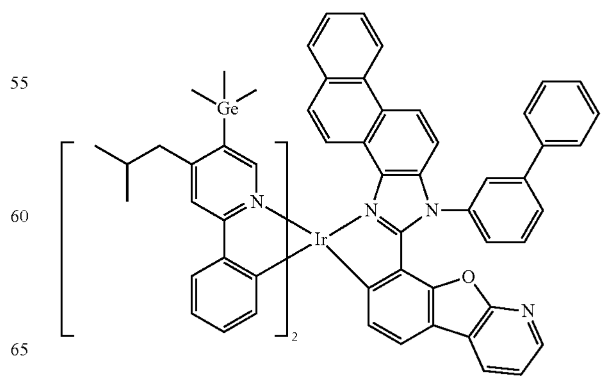

-continued
3570
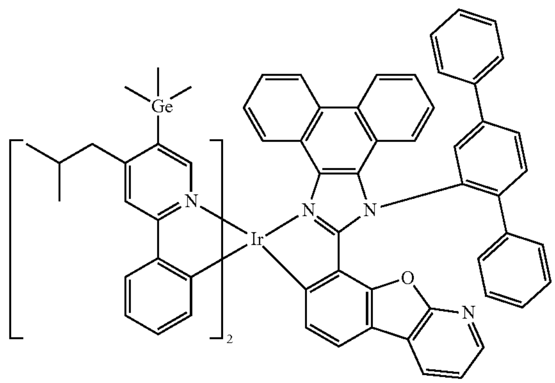
3571
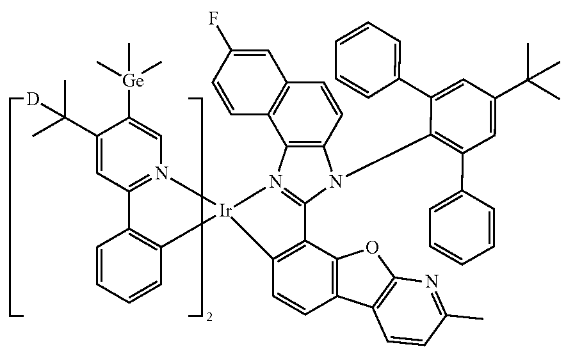
3572
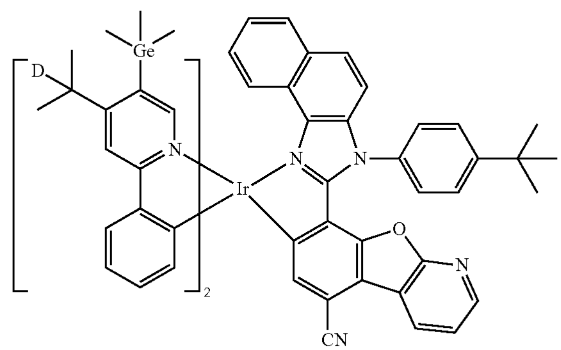
3573
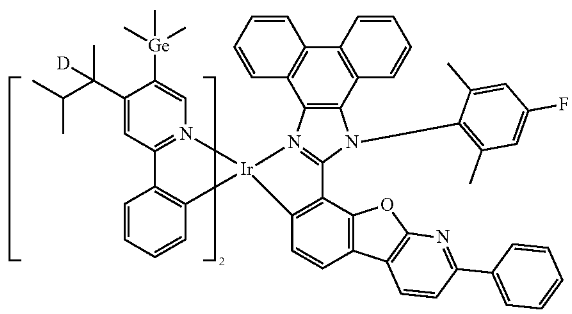
-continued
3574
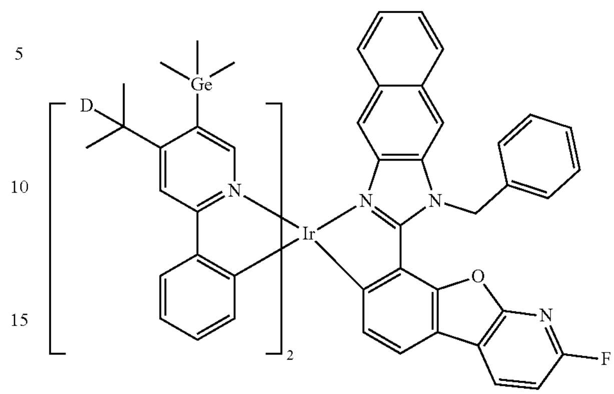
3575
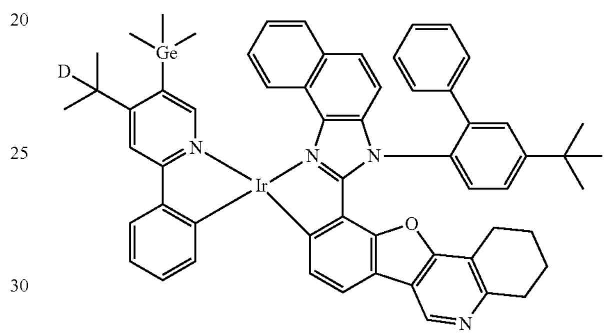
3576
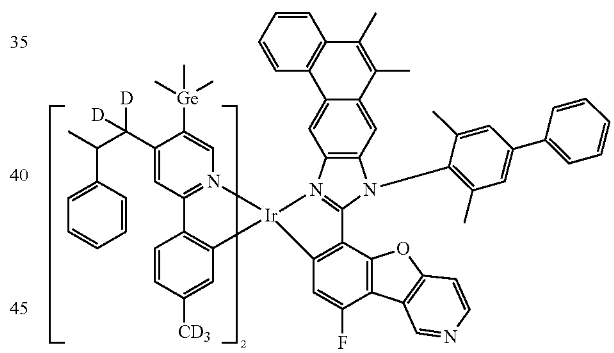
3577
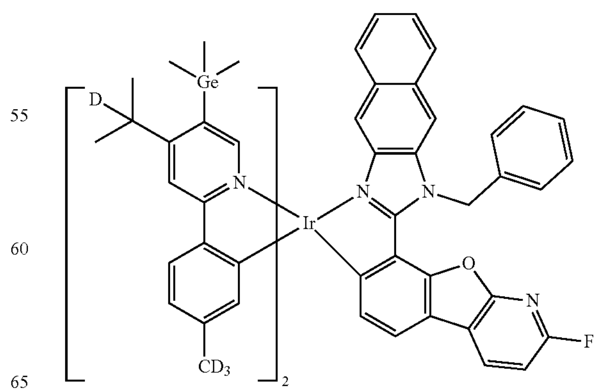

-continued
3578
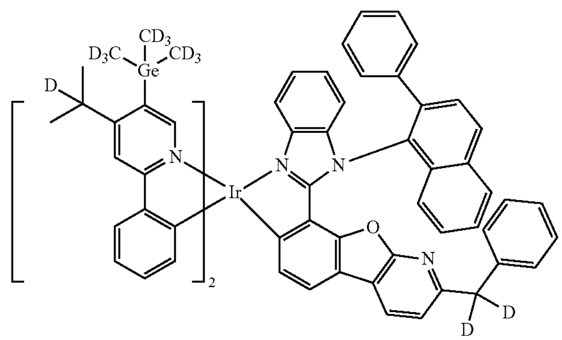
3579
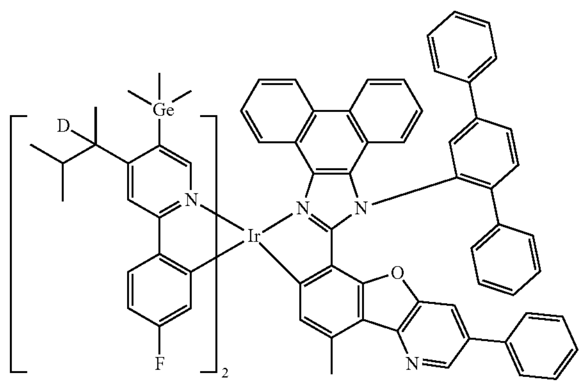
3580
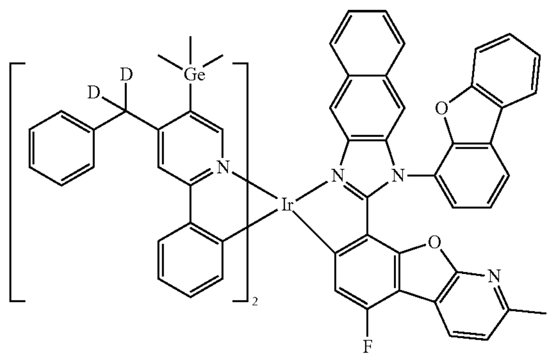
3581
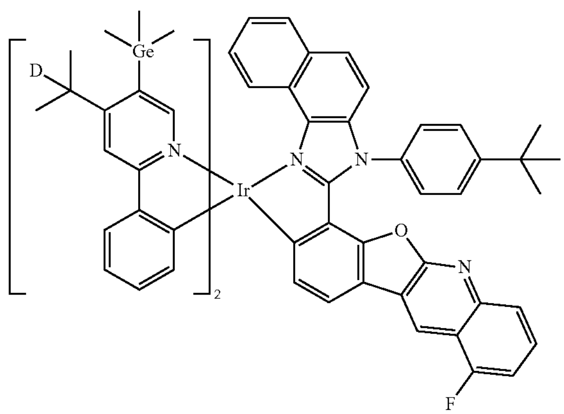
-continued
3582
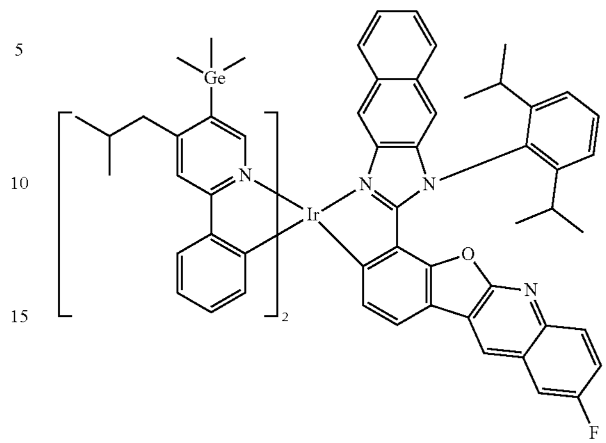
3583
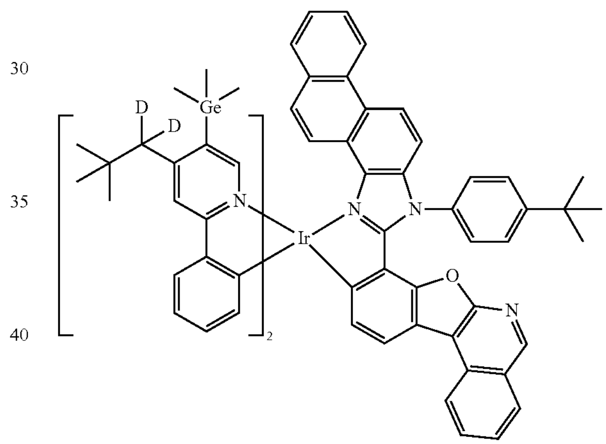
3584
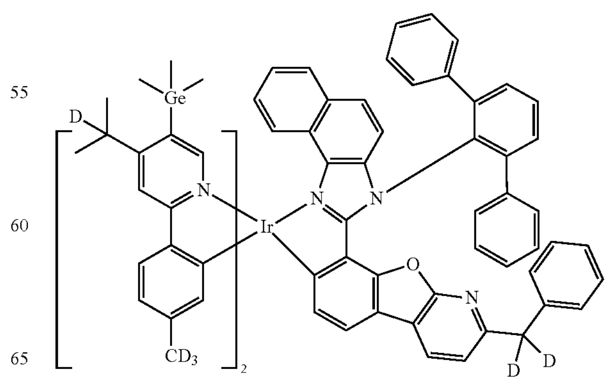

-continued
3585
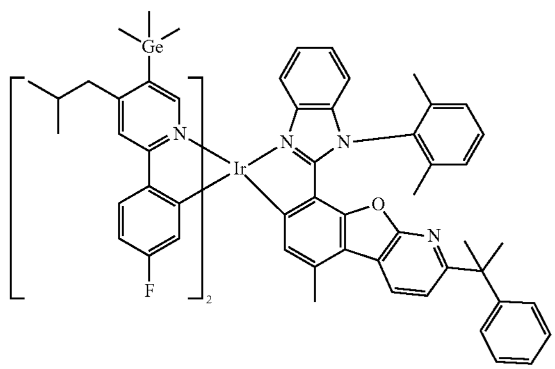
3586
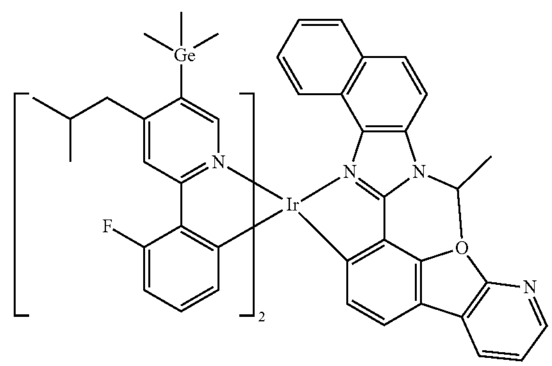
3587
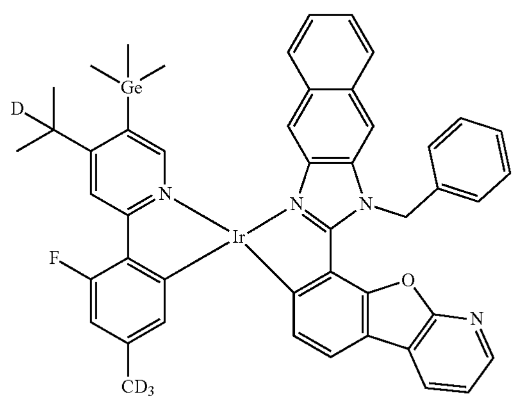
3588
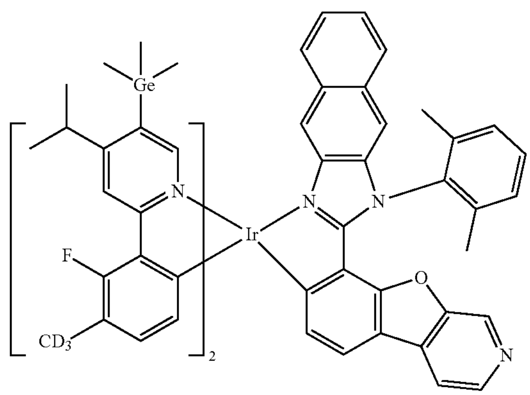
-continued
3589
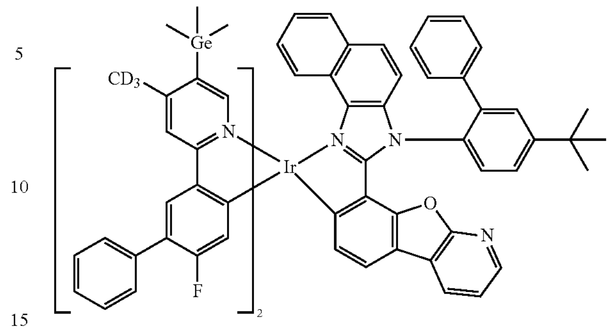
3590
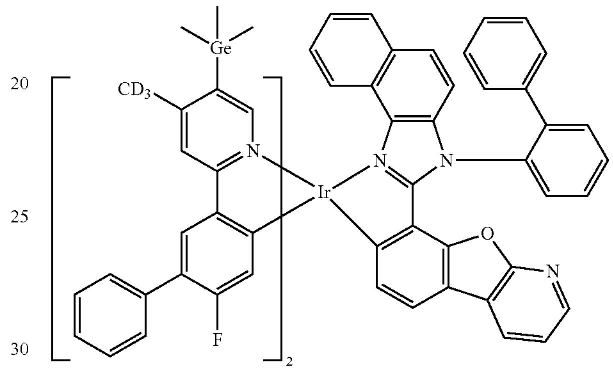
3591
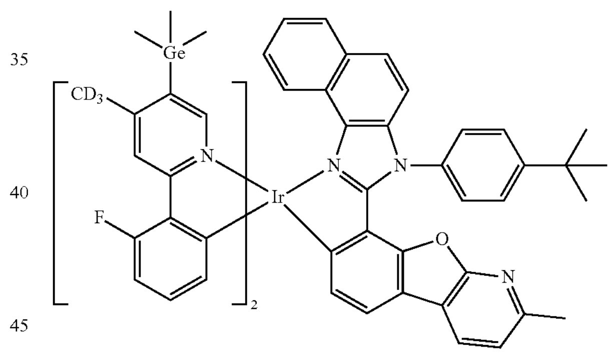
3592
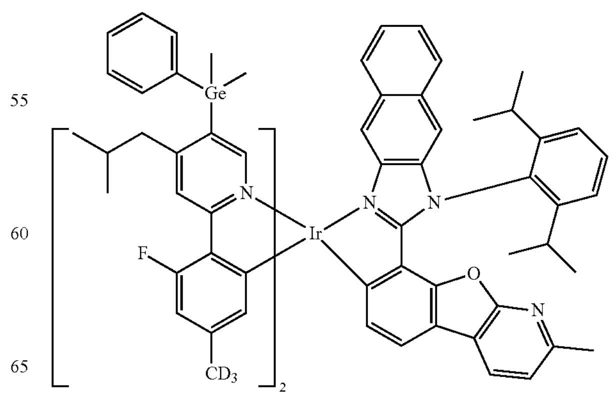

-continued
3593
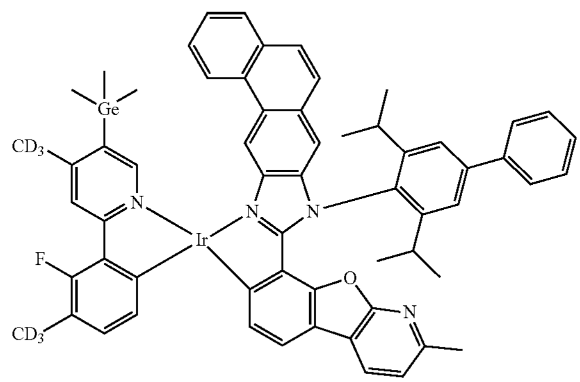
3594
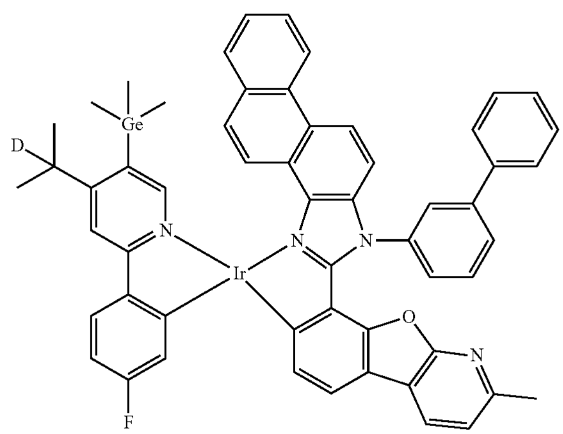
3595
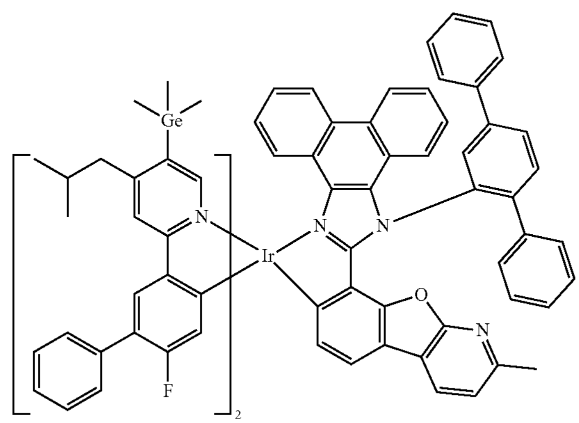
3596
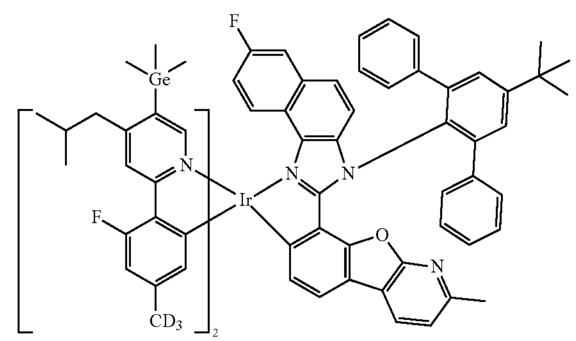
-continued
3597
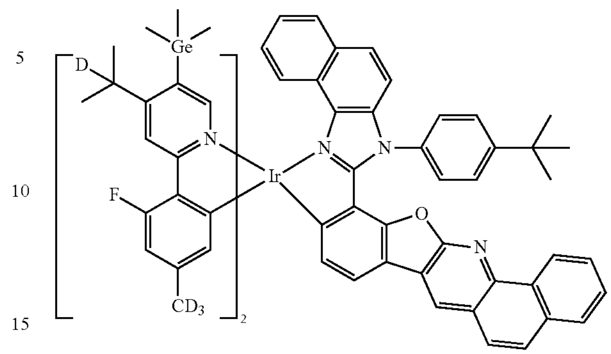
3598
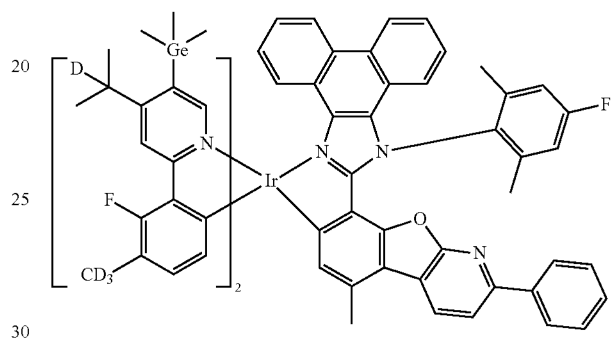
3599
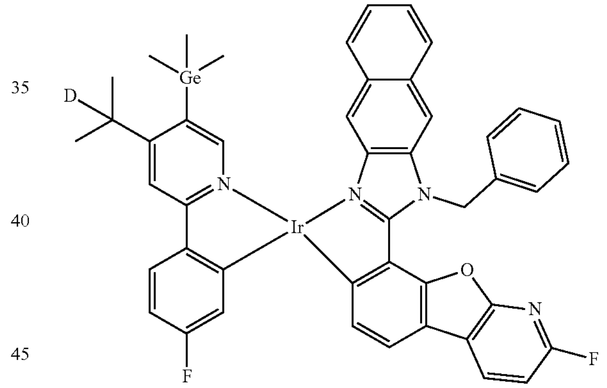
3600
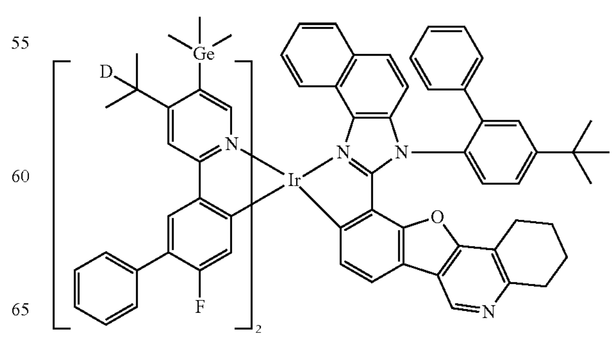

-continued
3601
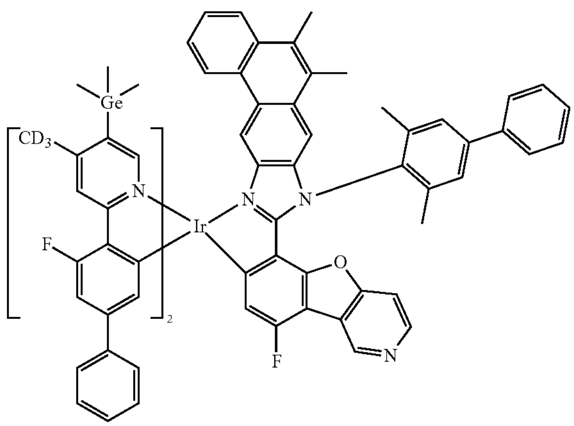
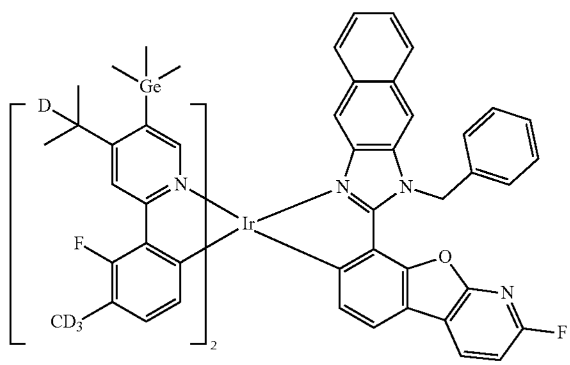
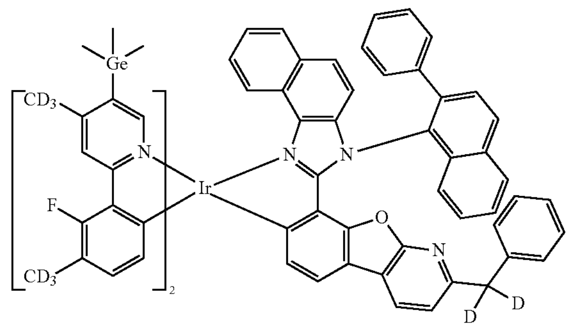
3535
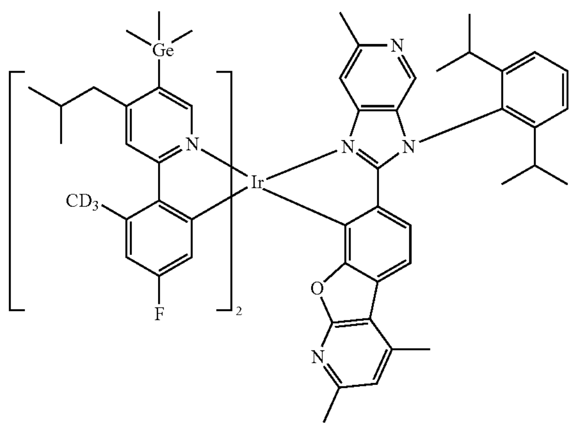
-continued
3536
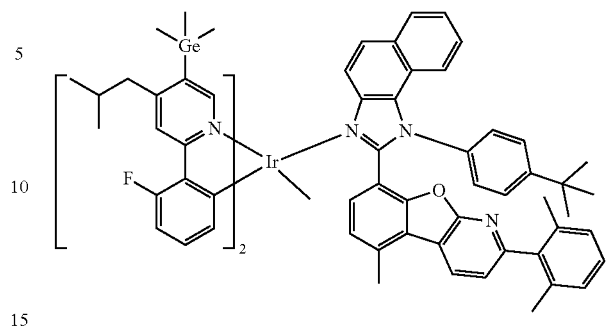
3537
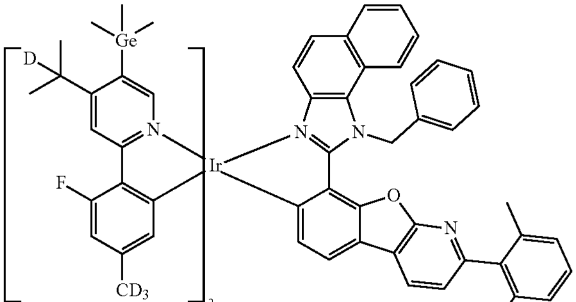
3538
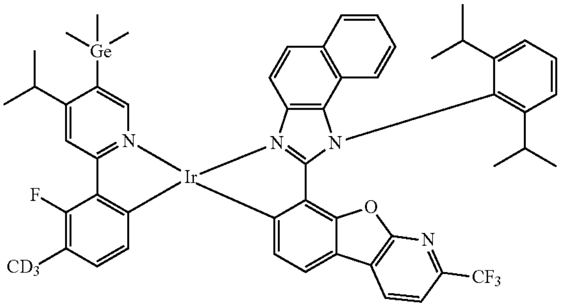
3539
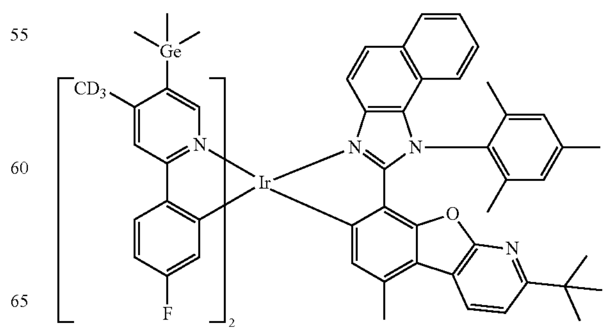

-continued
3540
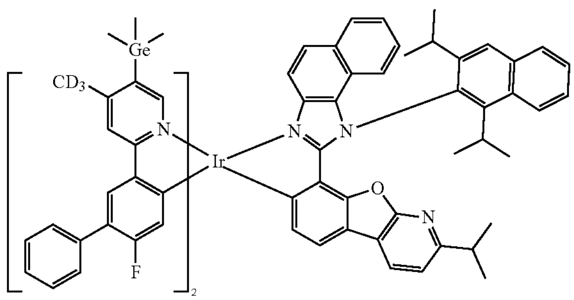
3541
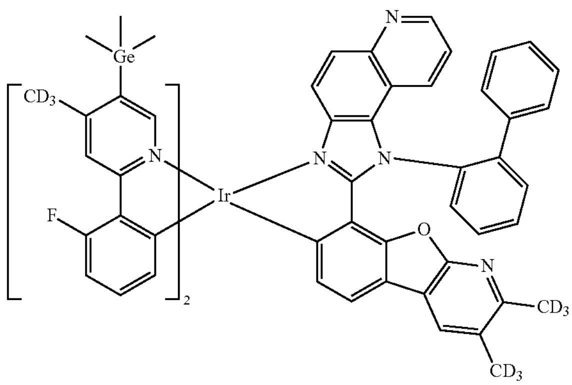
3542
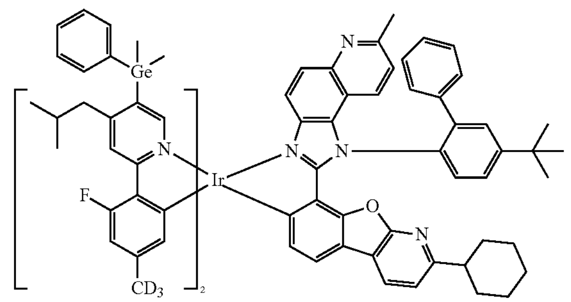
3543
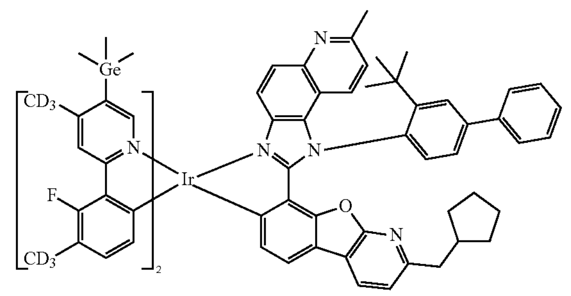
3711
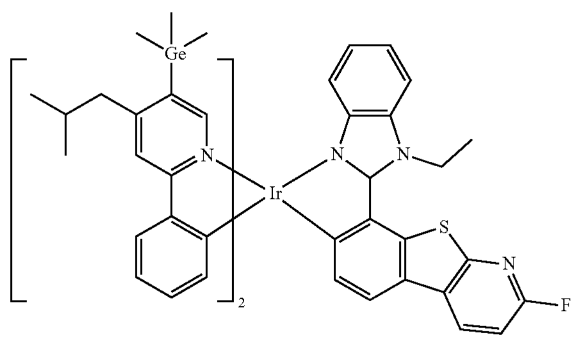
3712
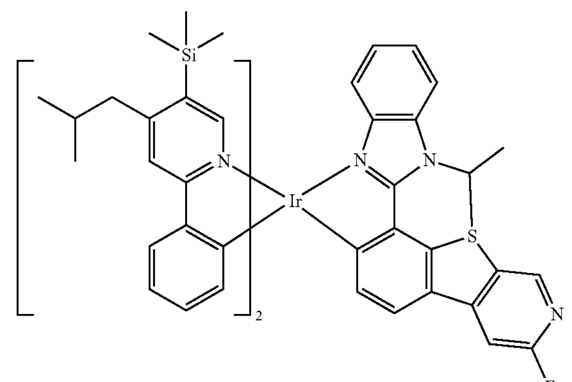
3713
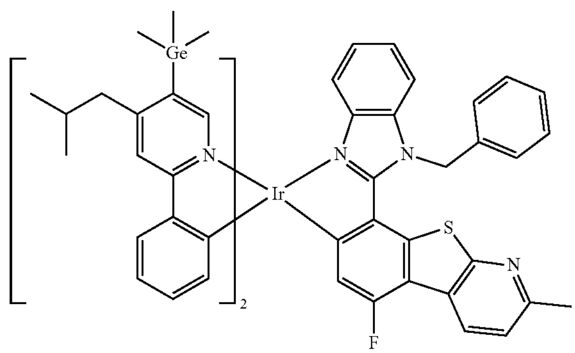
3714
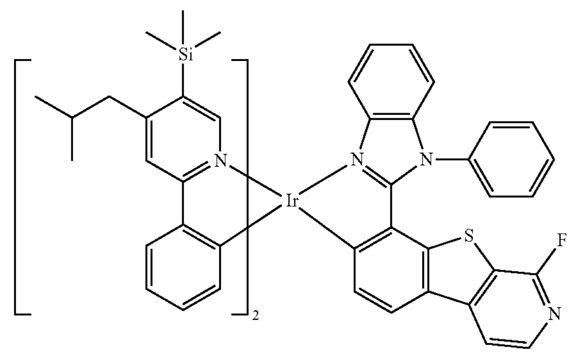

-continued
3715
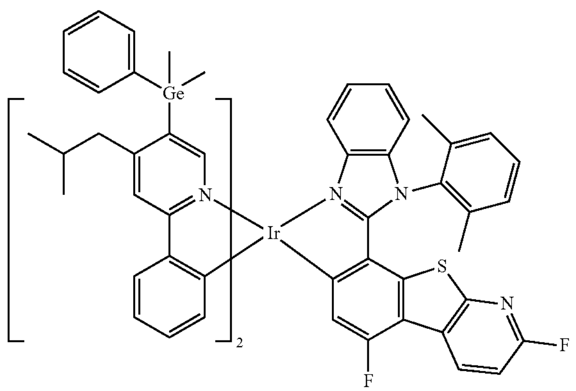
3716
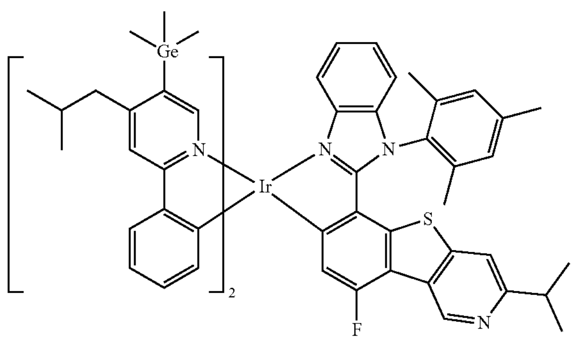
3717
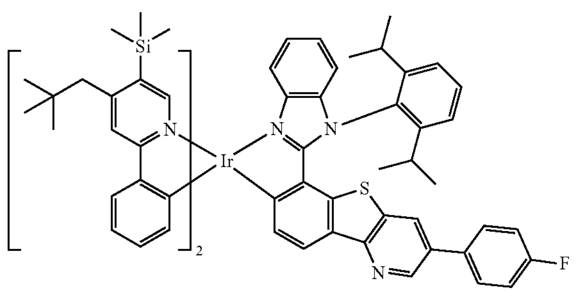
3718
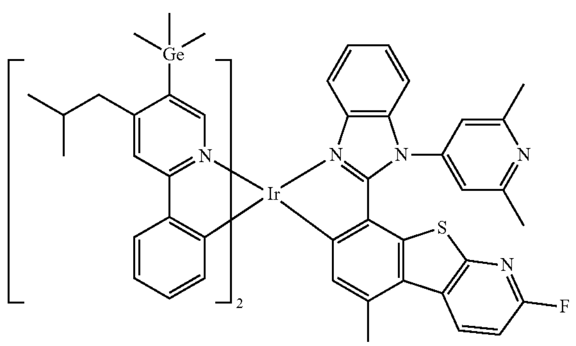
-continued
3719
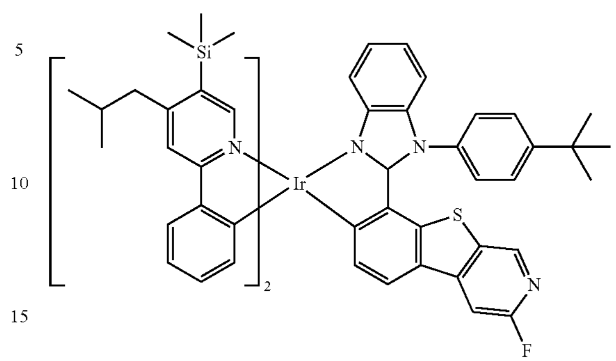
3720
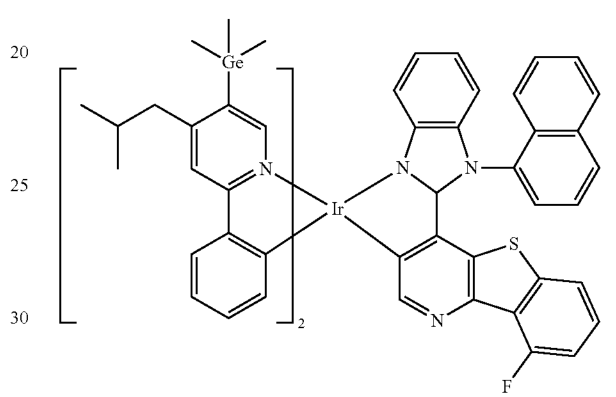
3721
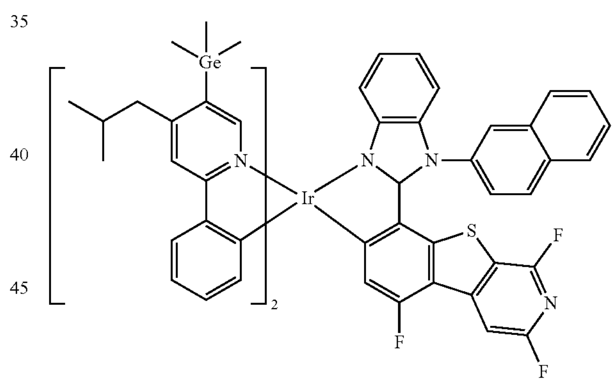
3722
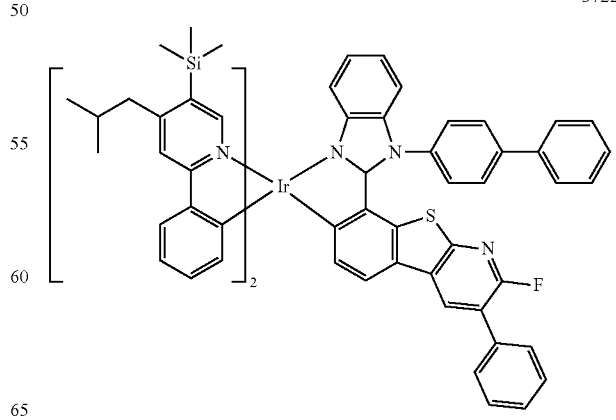

-continued
3723
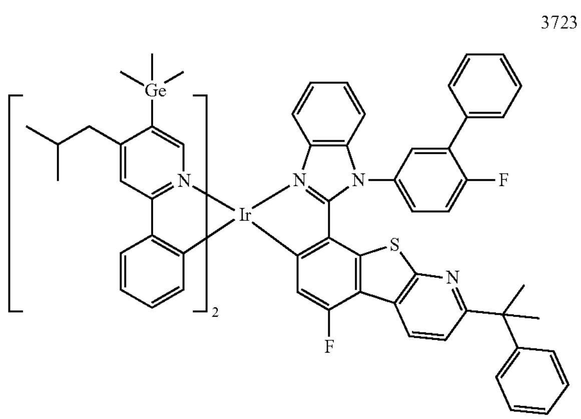
3724
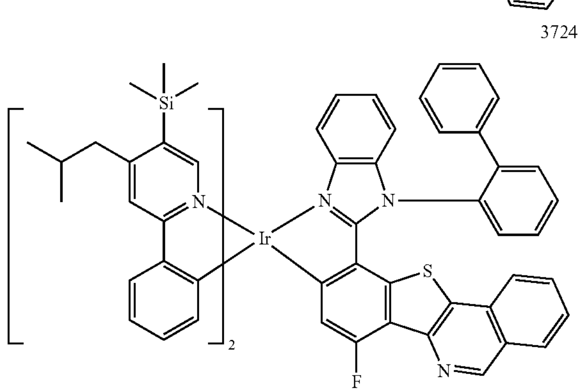
3725
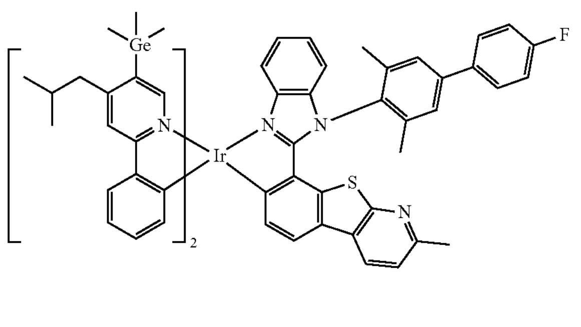
3726
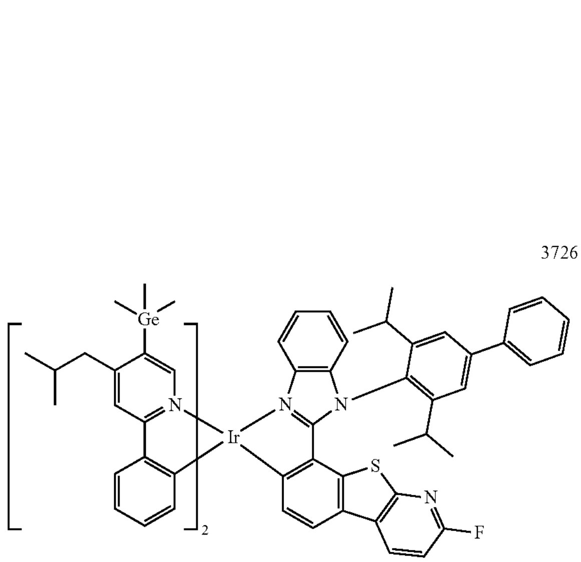
-continued
3727
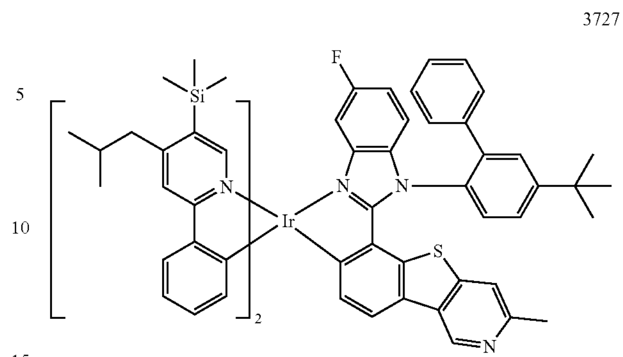
3728
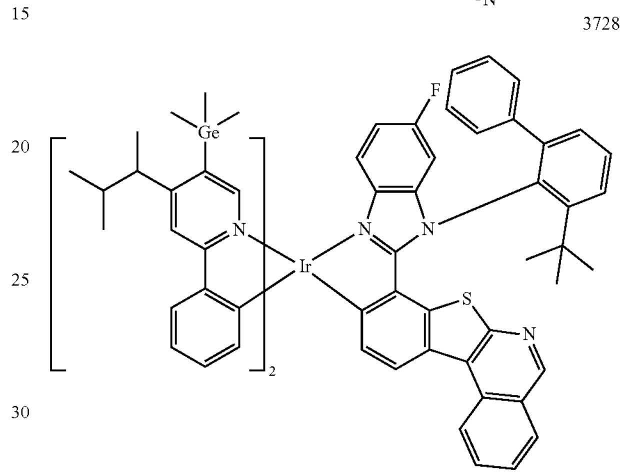
3729
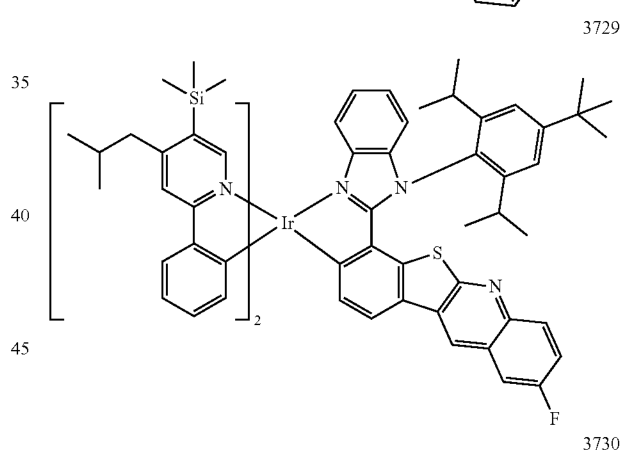
3730
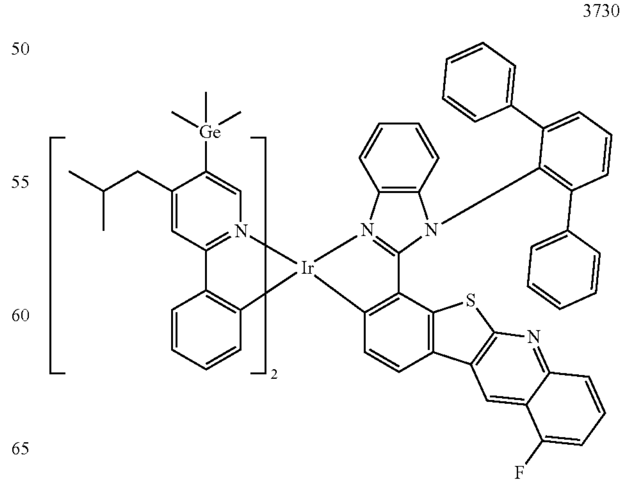

-continued
3731
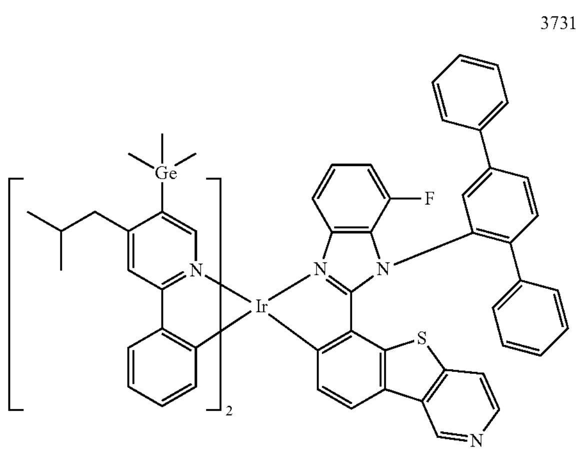
3732
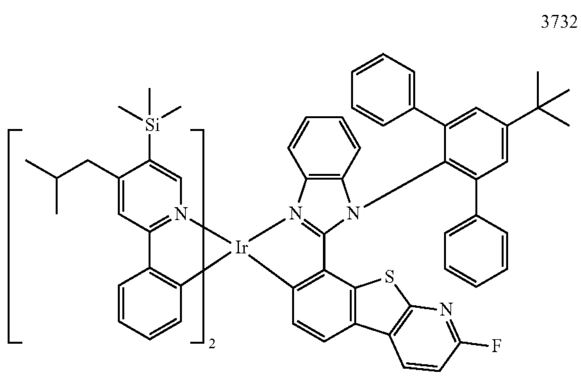
3733
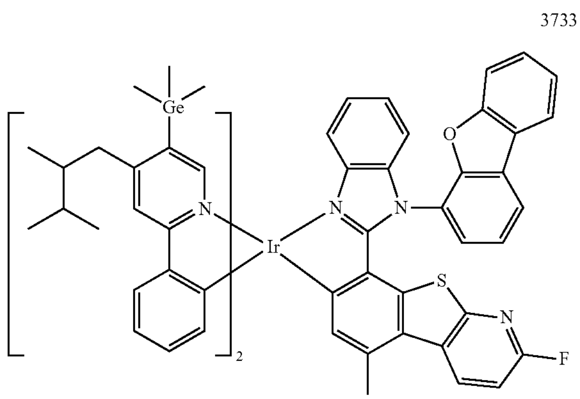
3734
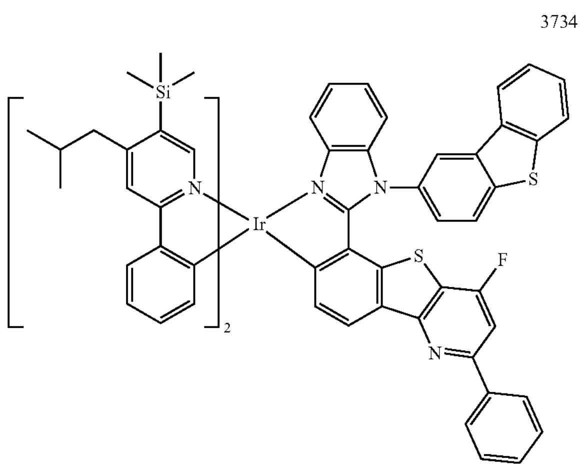
-continued
3735
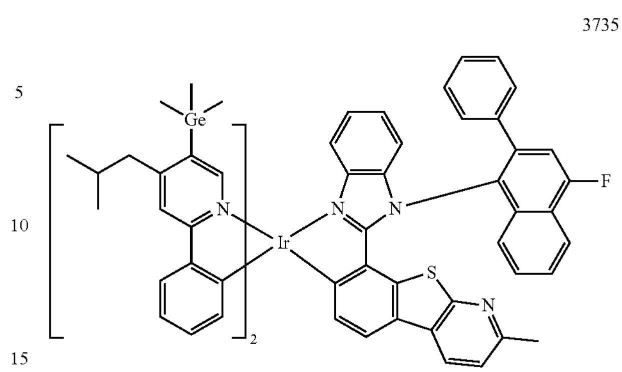
3736
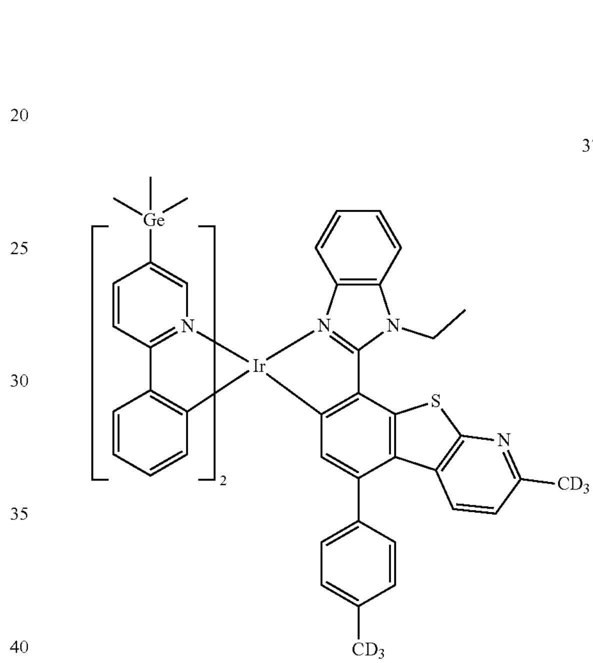
3737
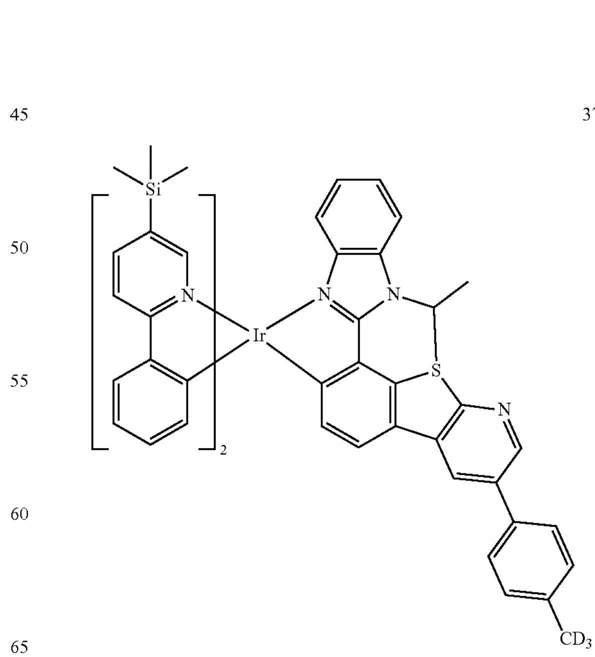

-continued
3738
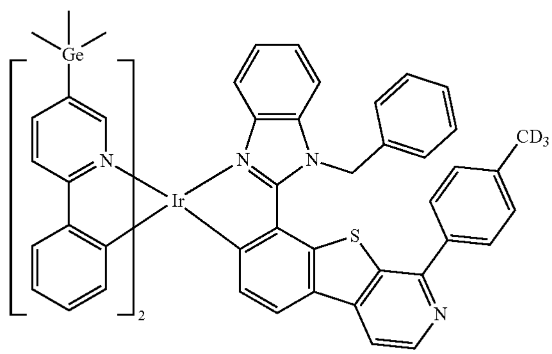
3739
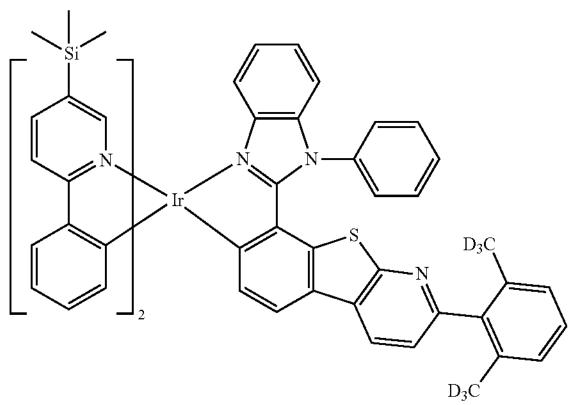
3740
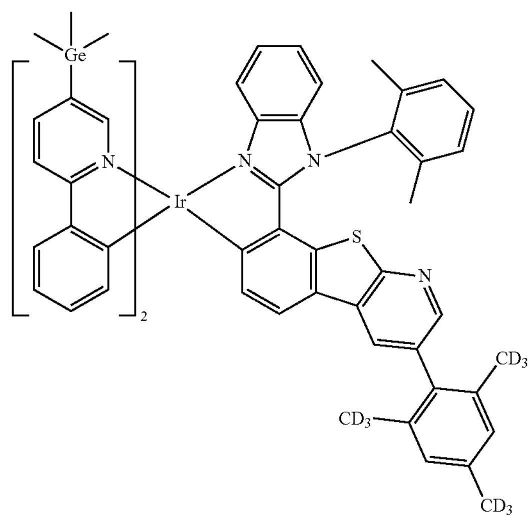
-continued
3741
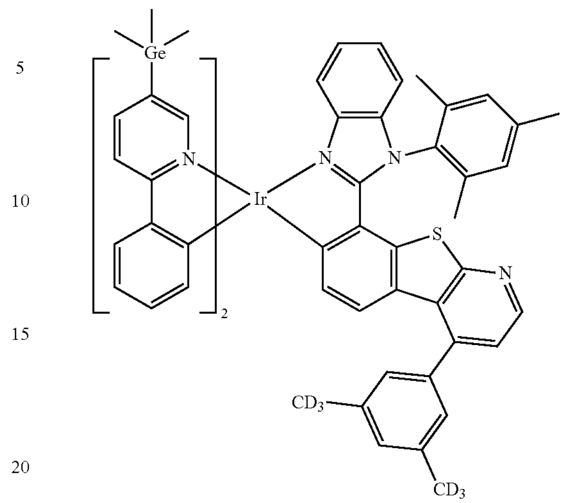
3742
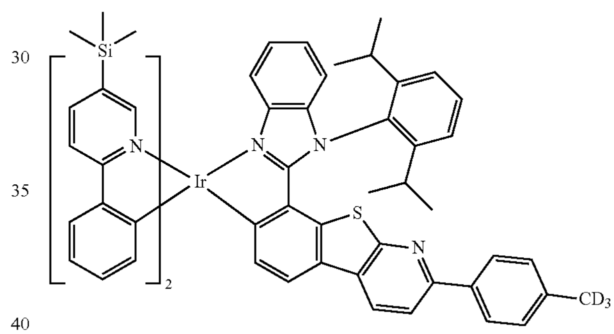
3743
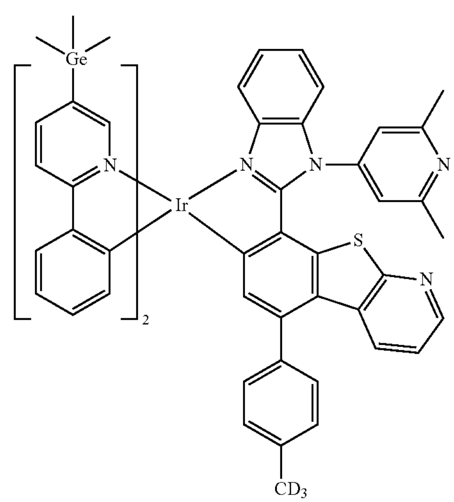

-continued
3744
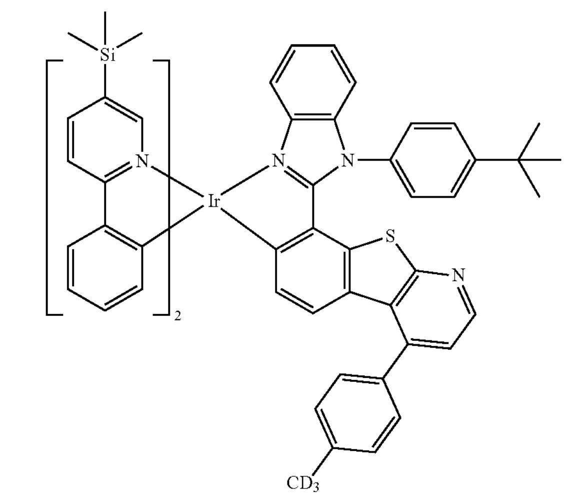
3745
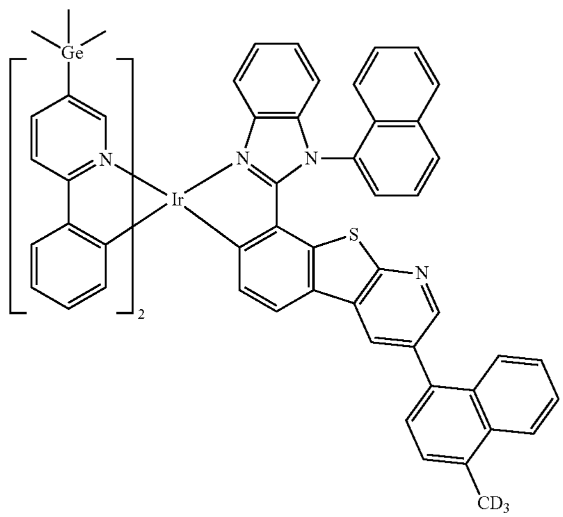
3746
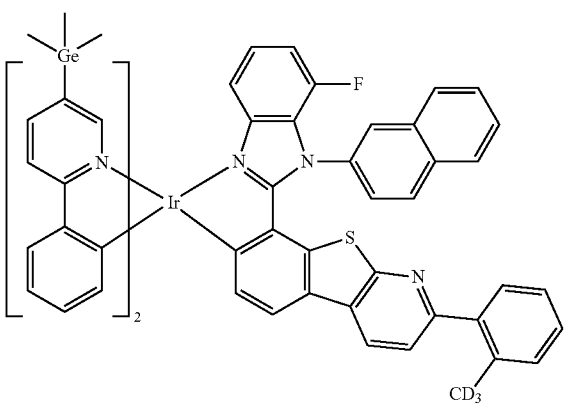
-continued
3747
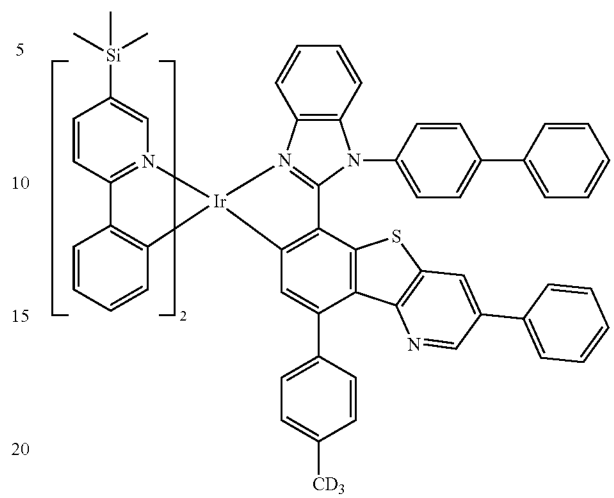
3748
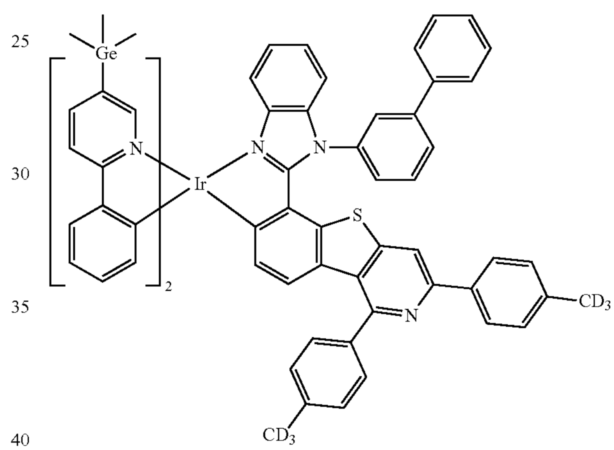
3749
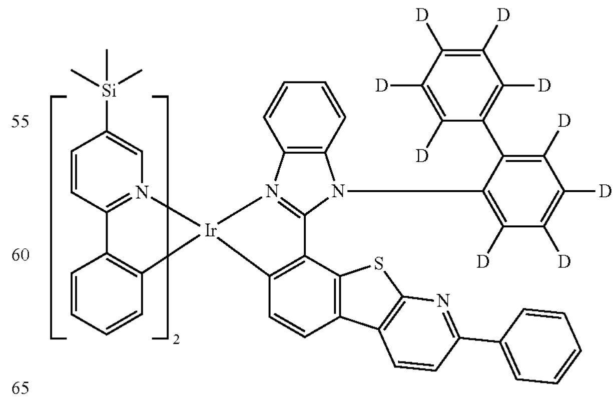

-continued
3750
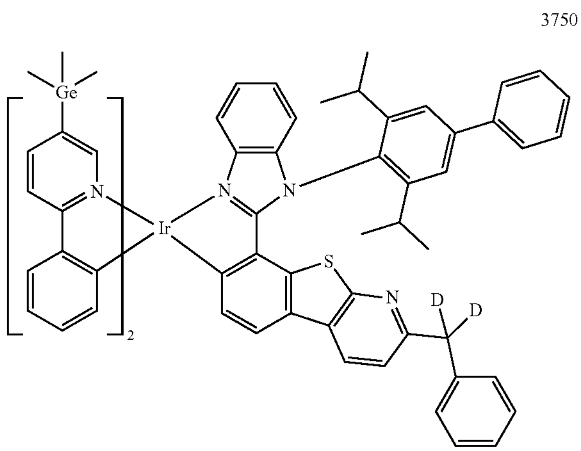
3751
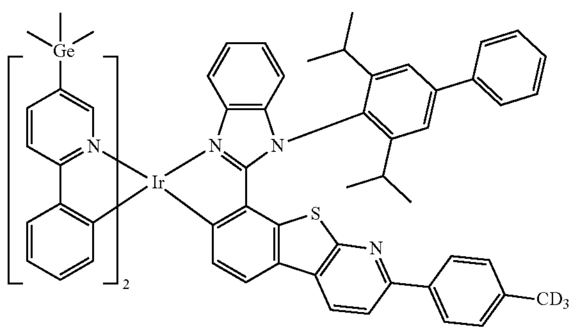
3752
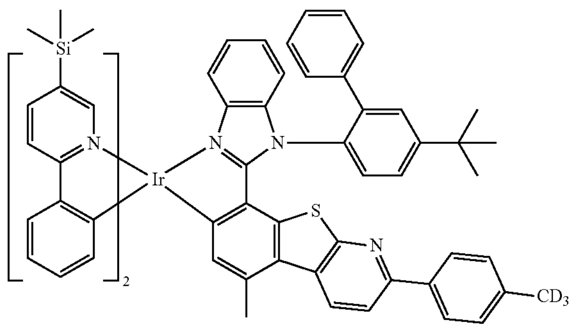
3753
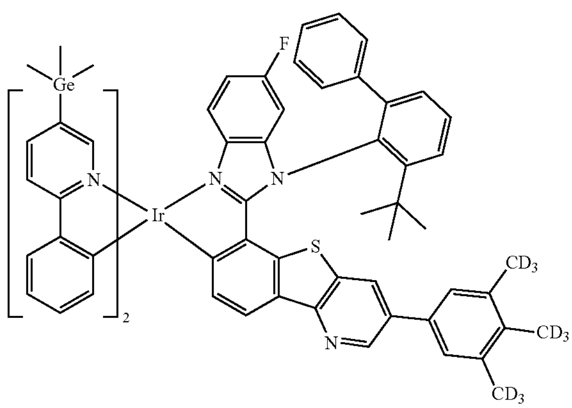
-continued
3754
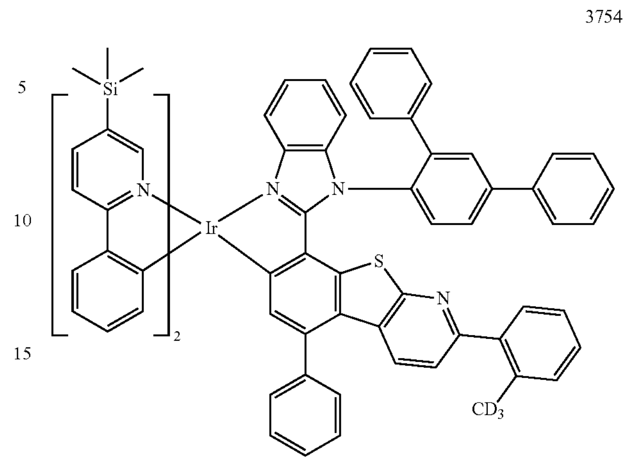
3755
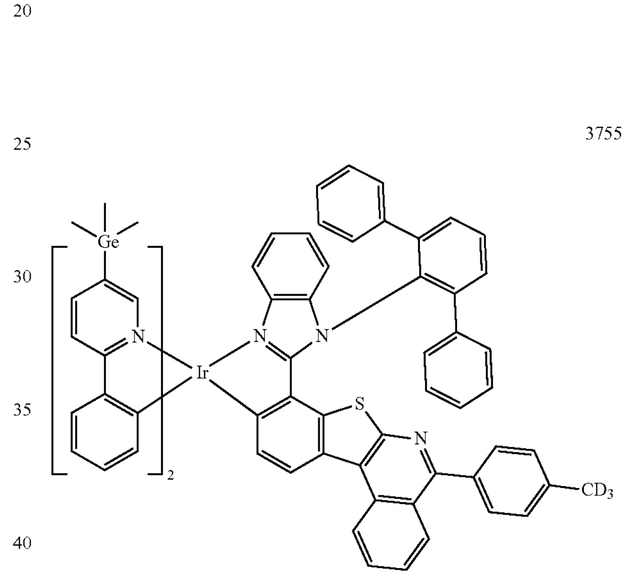
3756
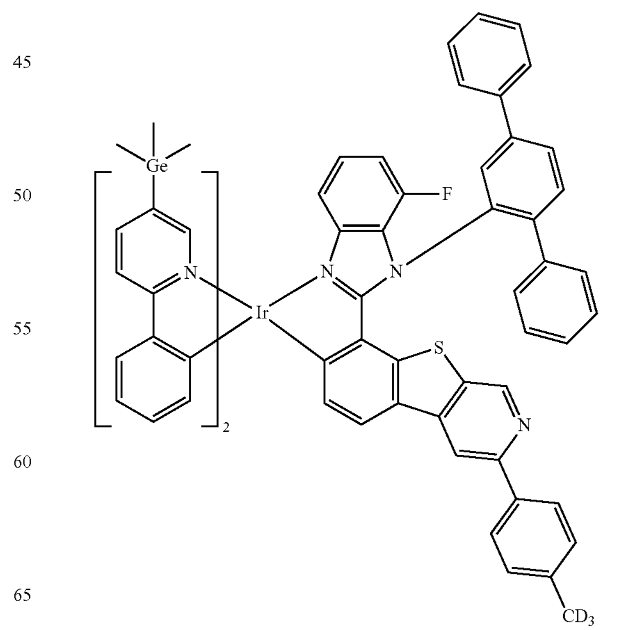

-continued
3757
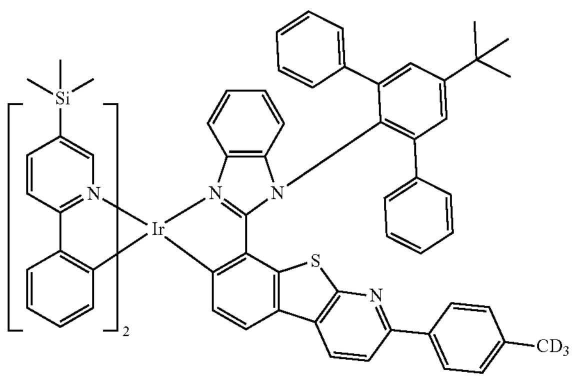
3758
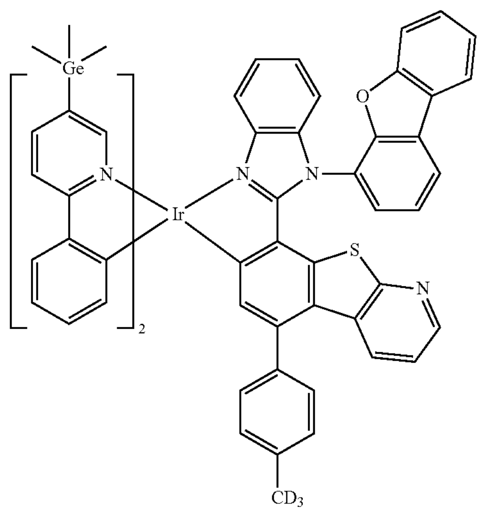
3759
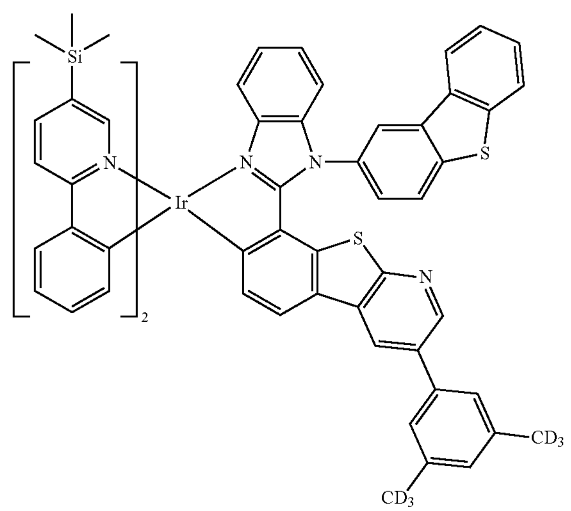
-continued
3760
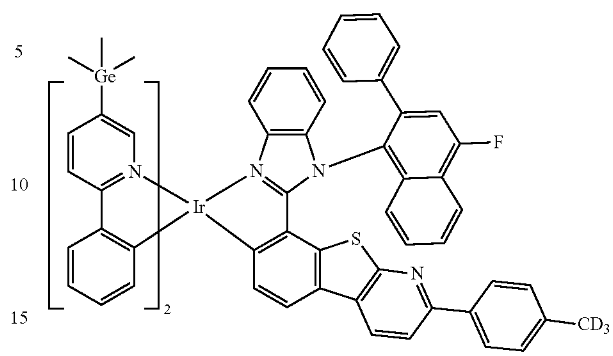
3761
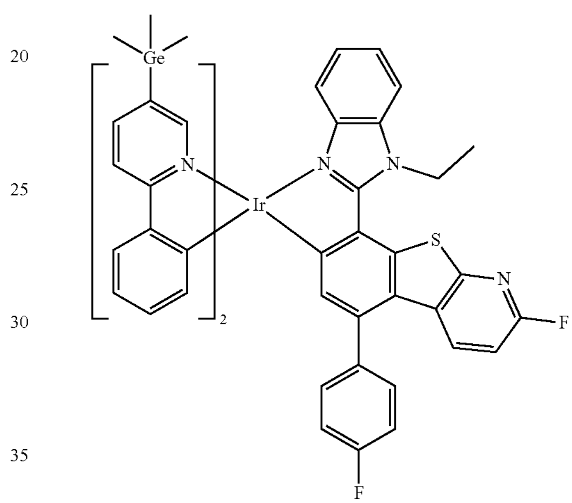
3762
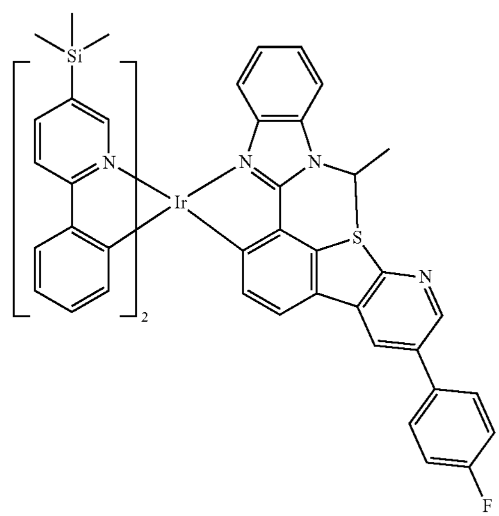

3763
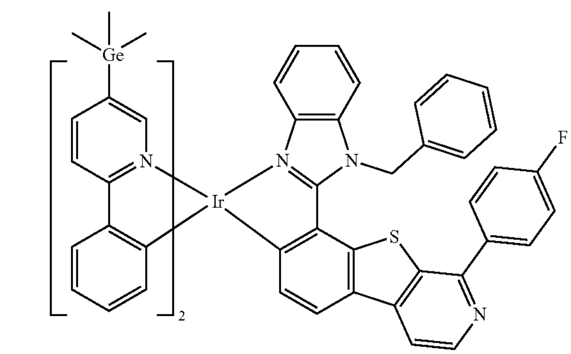
3764
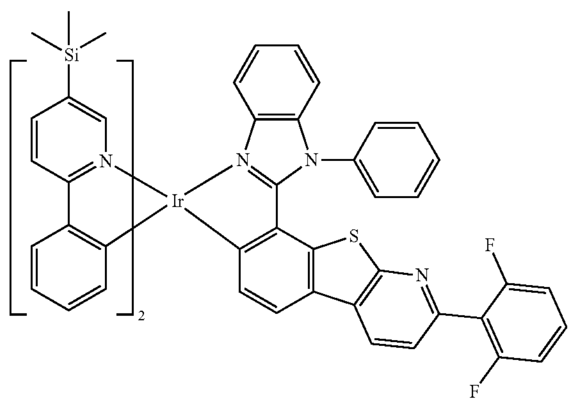
3765
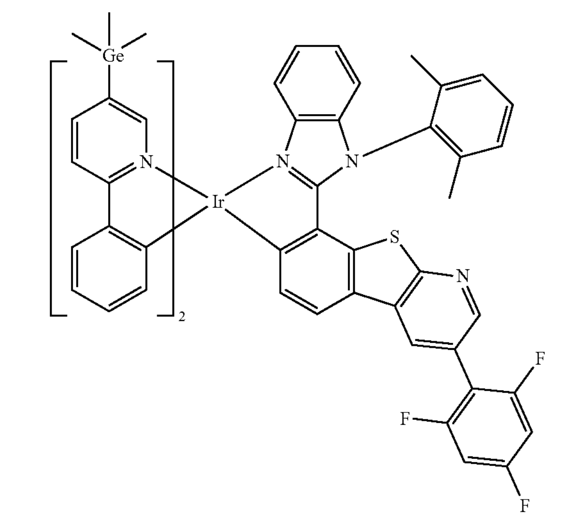
3766
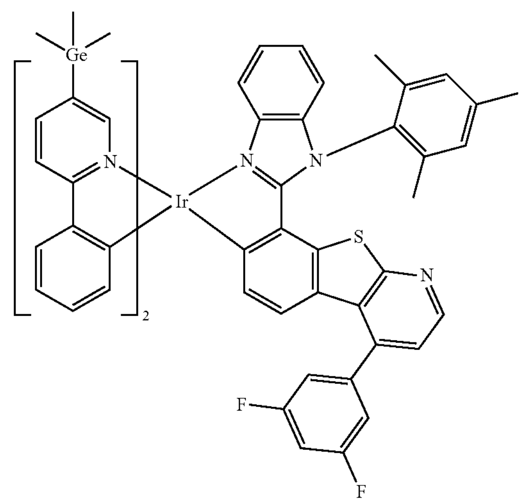
3767
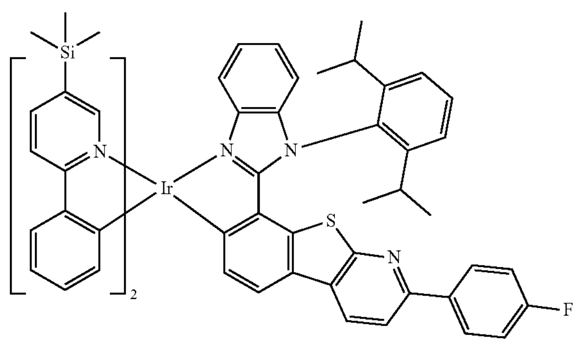
3768
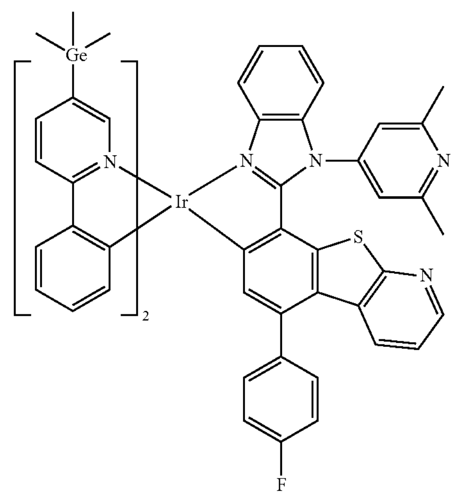

-continued
3769
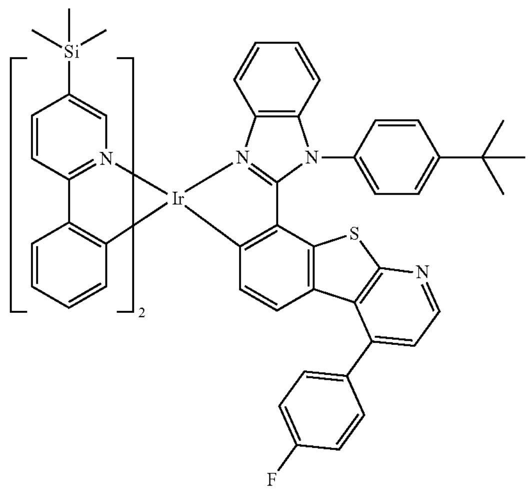
3770
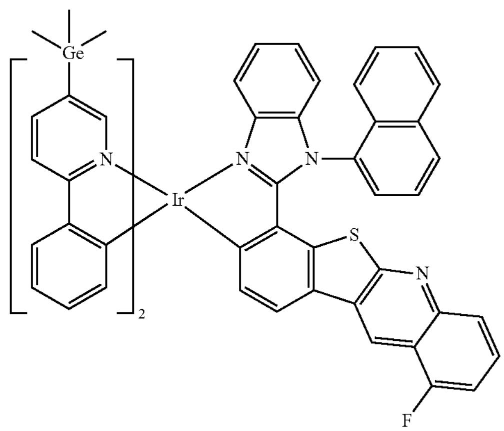
3771
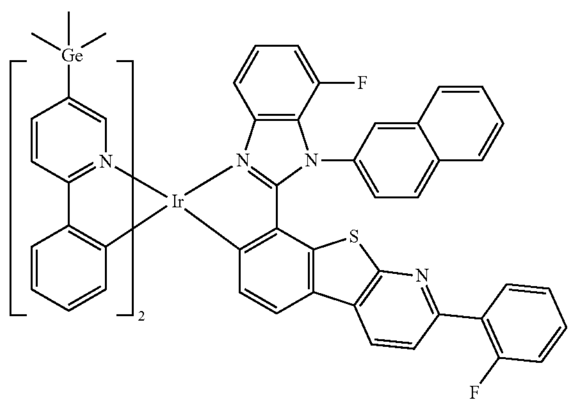
-continued
3772
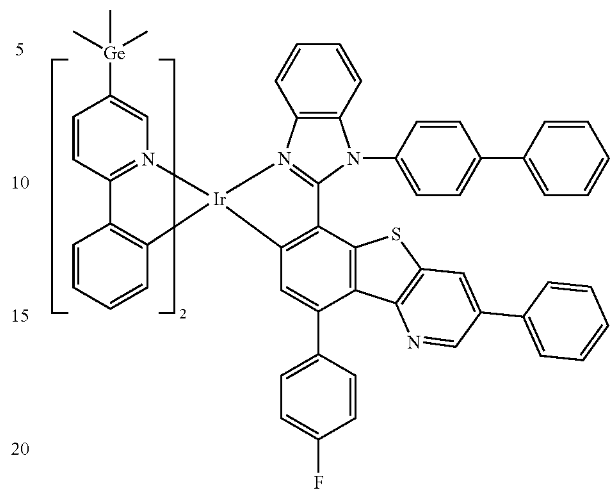
3773
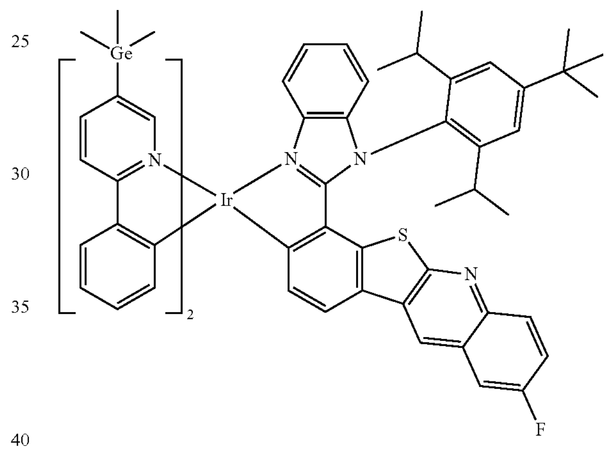
3774
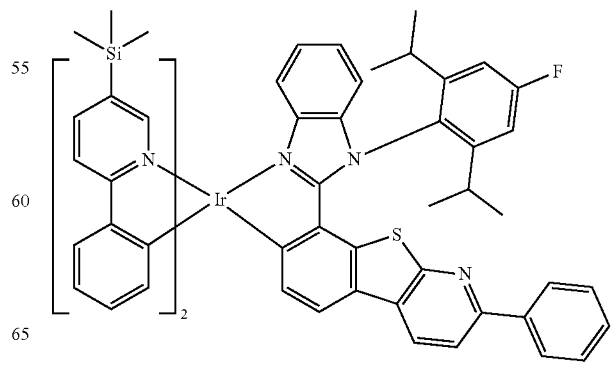

3775
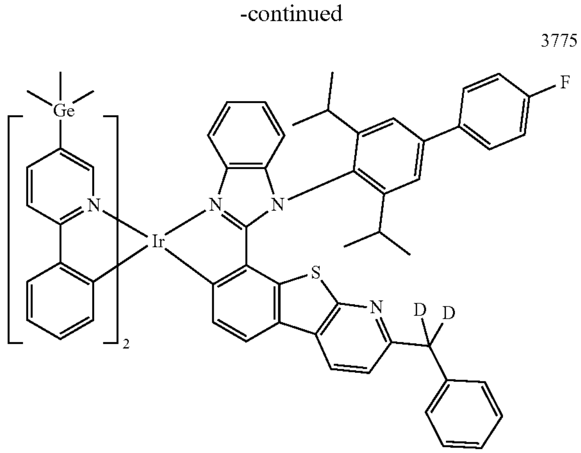
3776
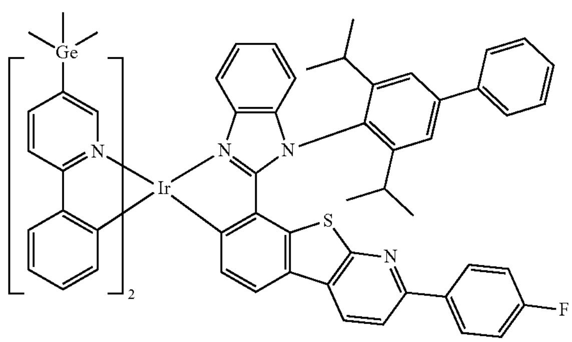
3777
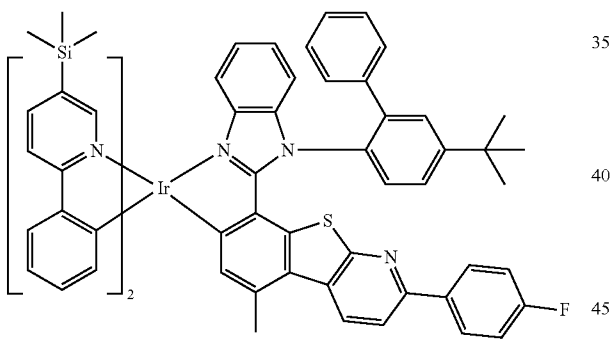
3778
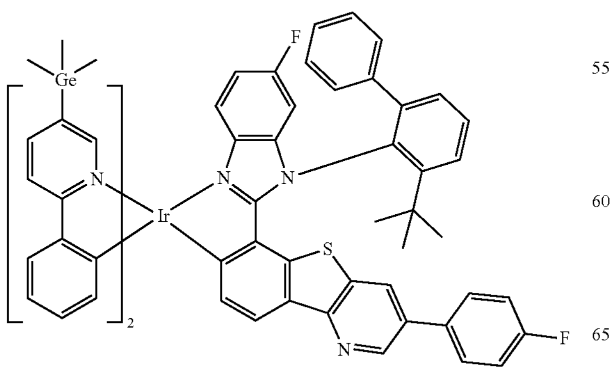
3779
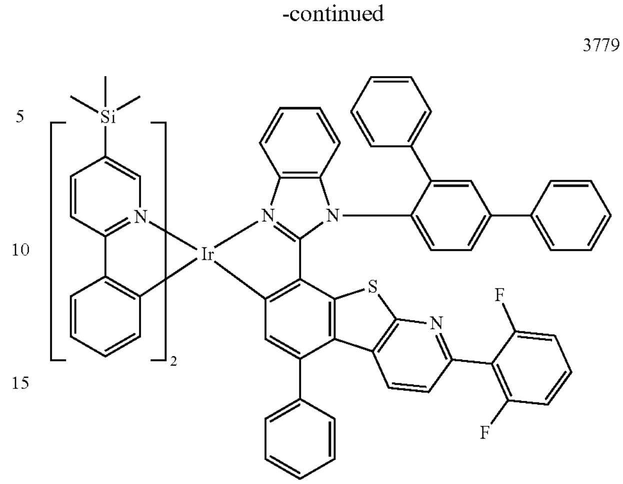
3780
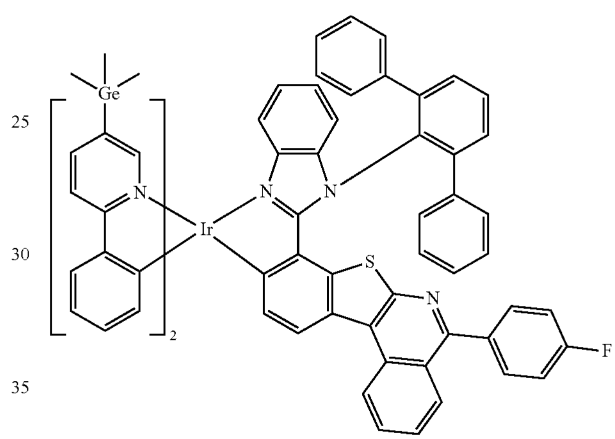
3781
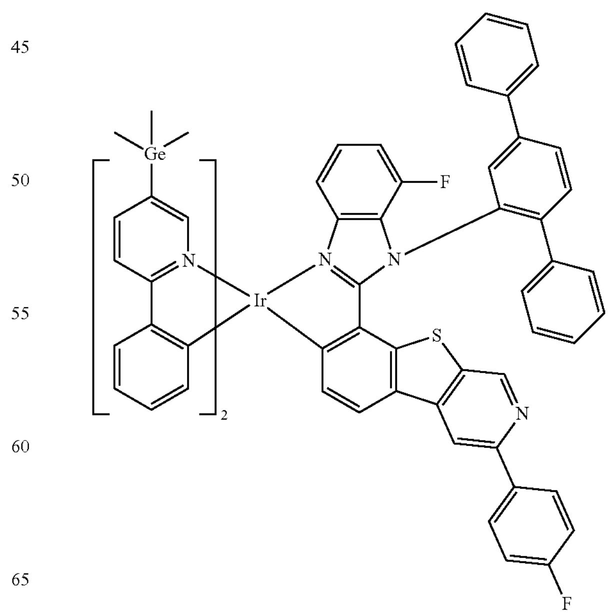

-continued
3782
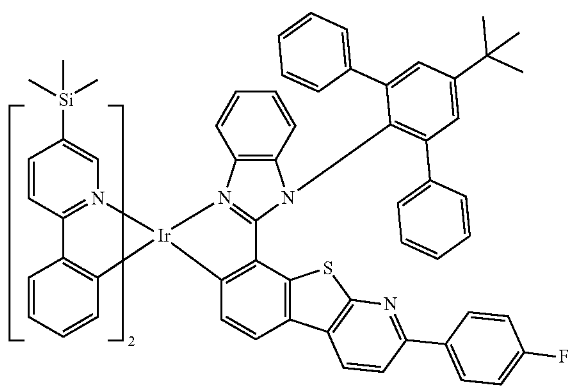
3783
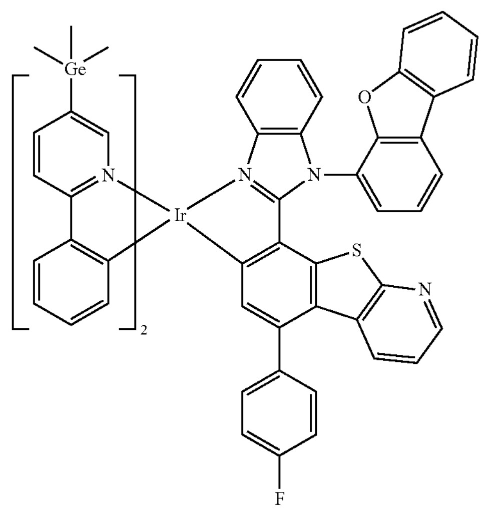
3784
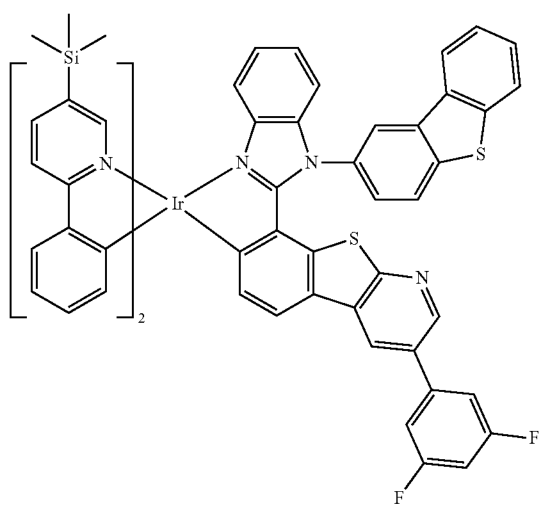
-continued
3785
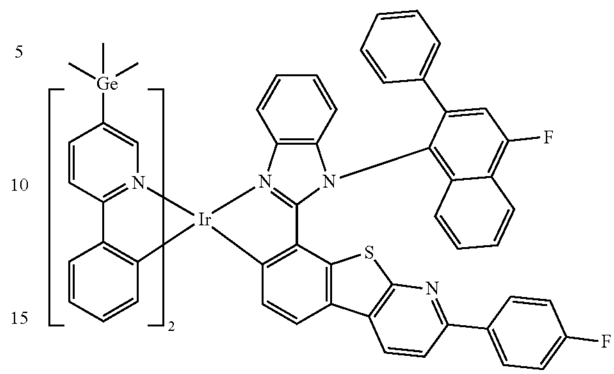
3786
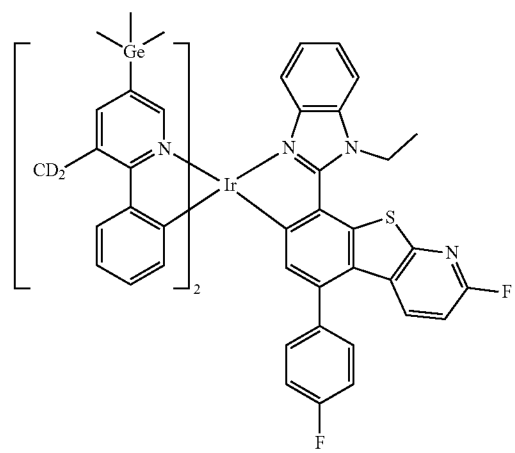
3787
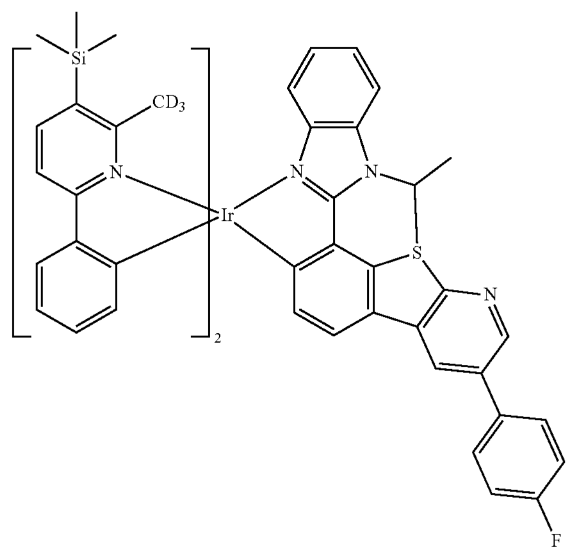

-continued
3788
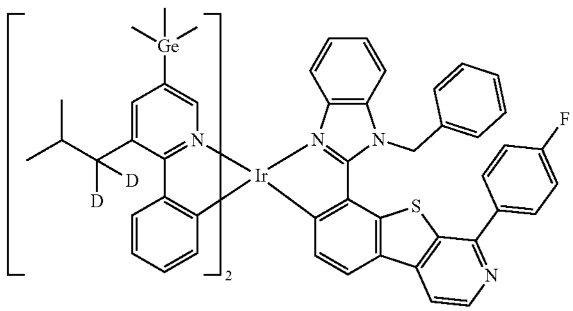
3789
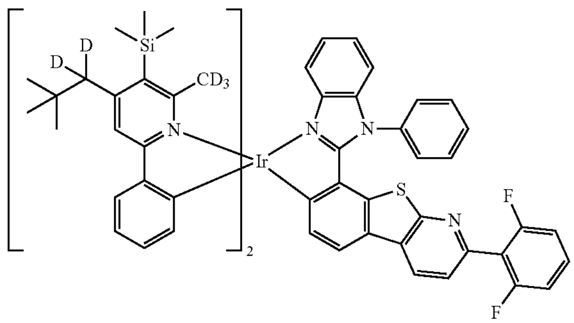
3790
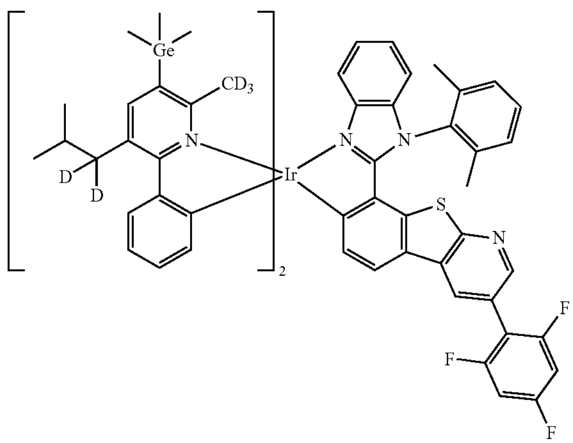
3791
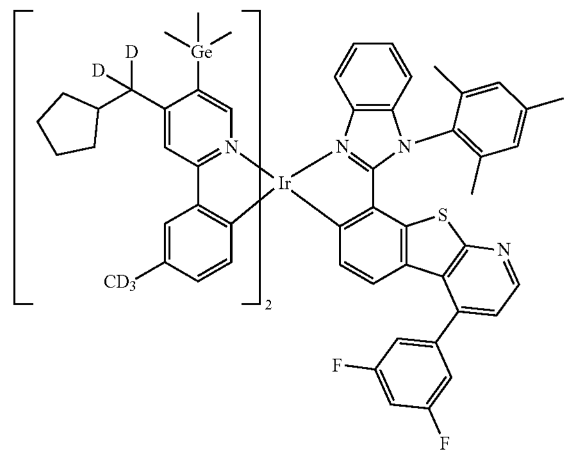
-continued
3792
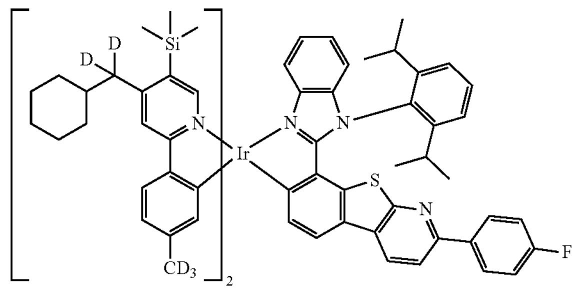
3793
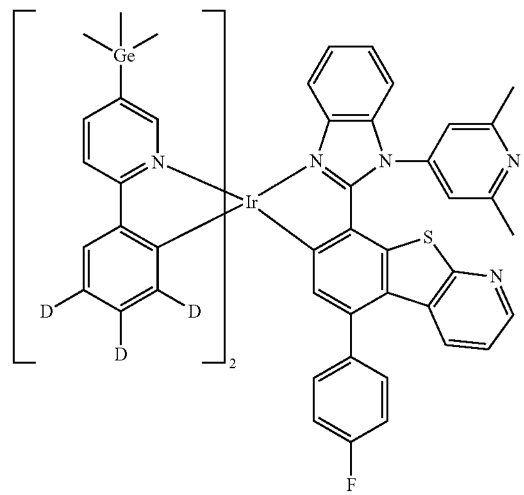
3794
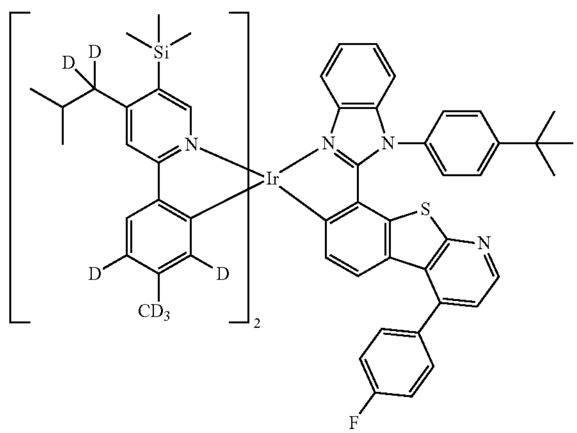

-continued
3795
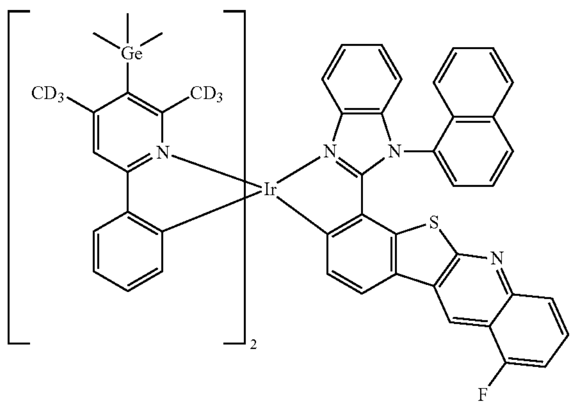
3796
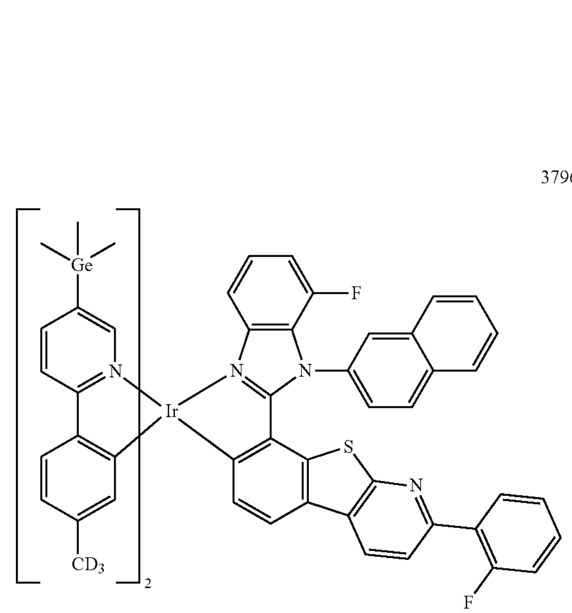
3797
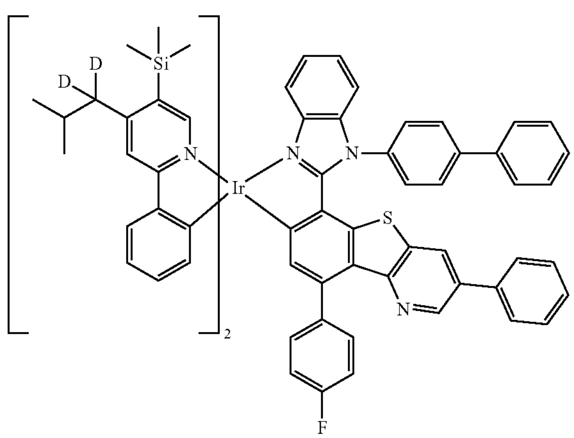
3798
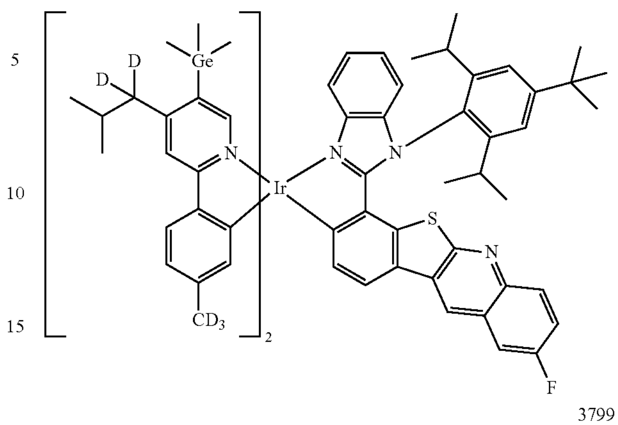
3799
3800
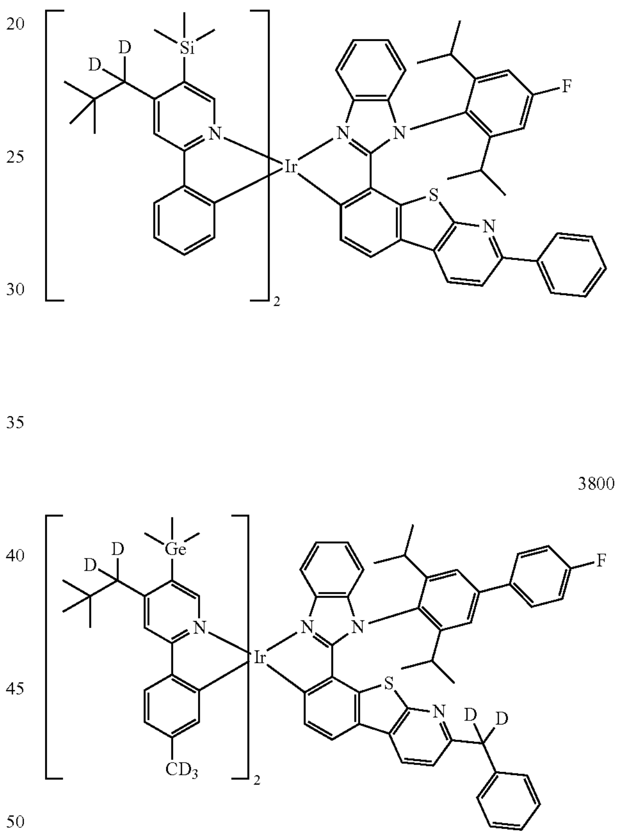
3801
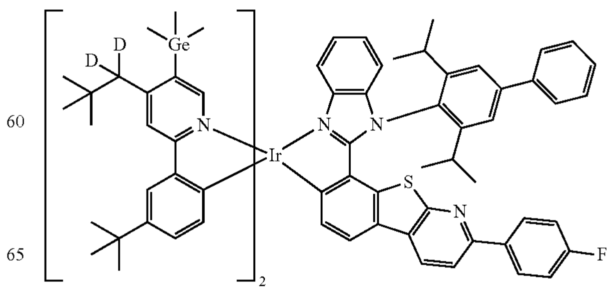

-continued
3802
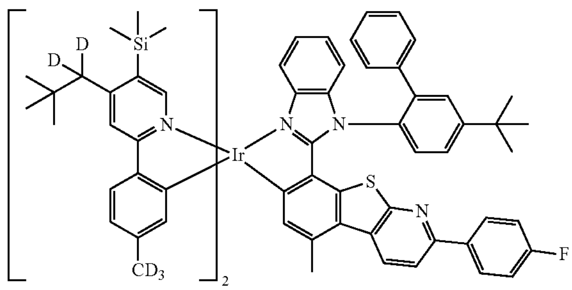
3803
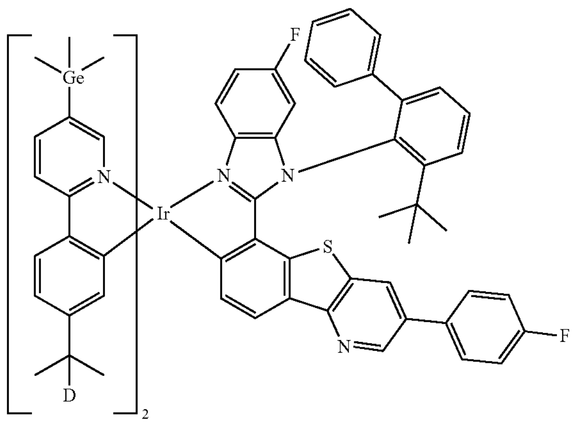
3804
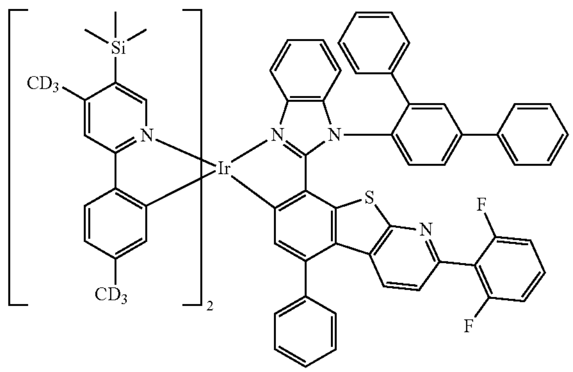
3805
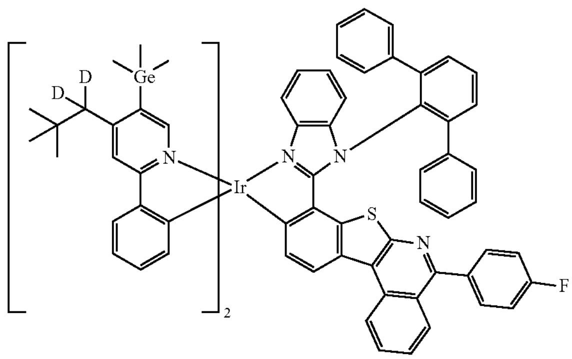
-continued
3806
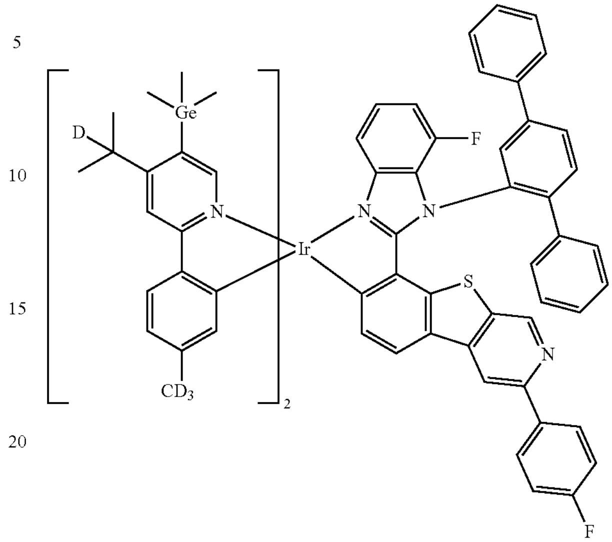
3807
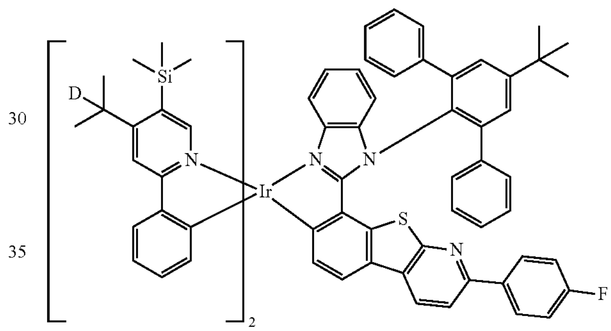
3808
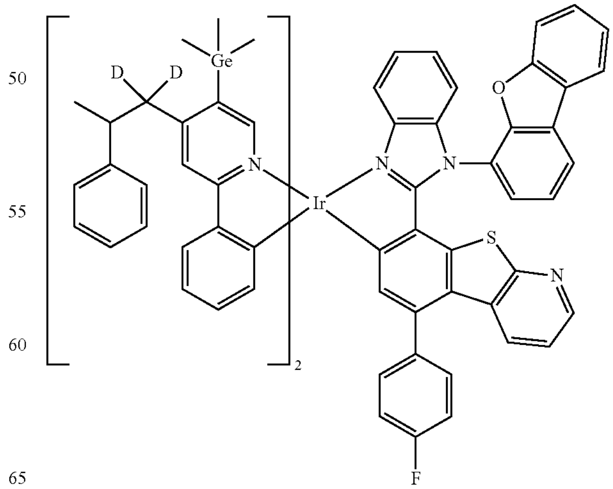

-continued
3809
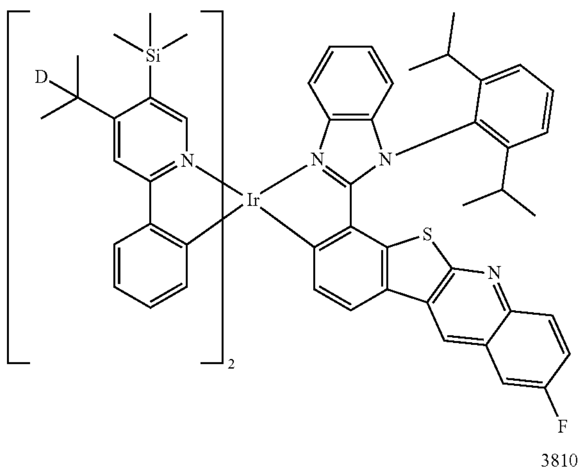
3810
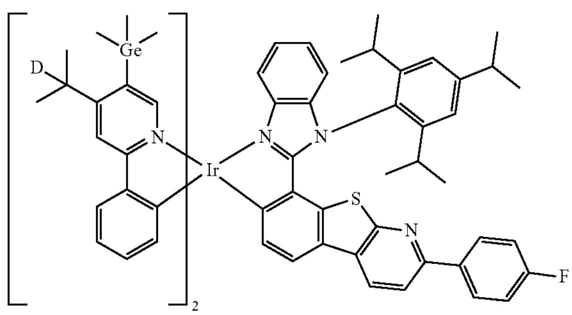
3811
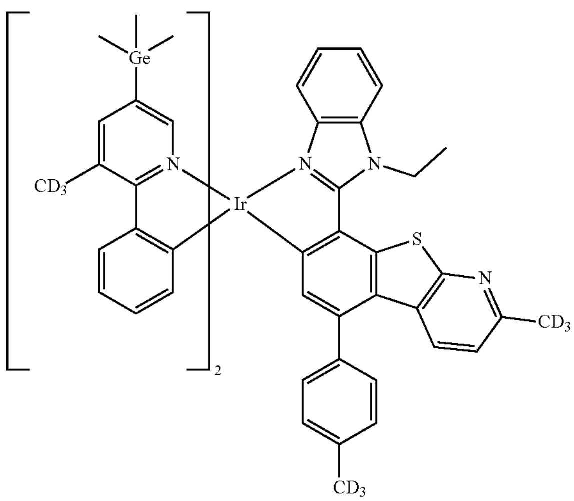
-continued
3812
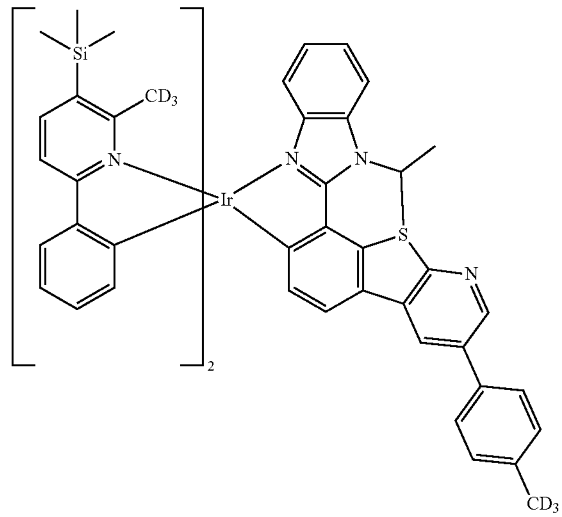
3813
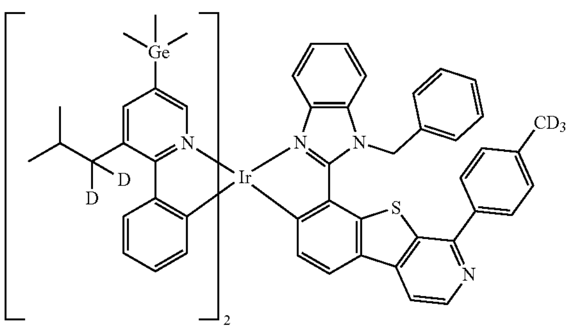
3814
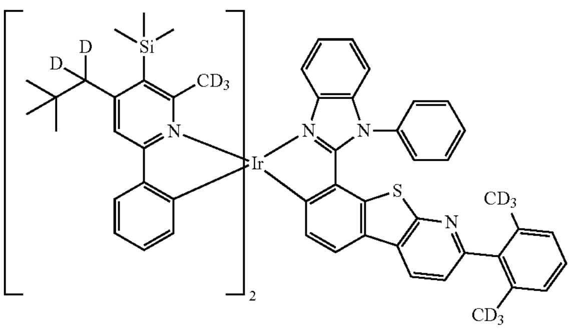

-continued
3815
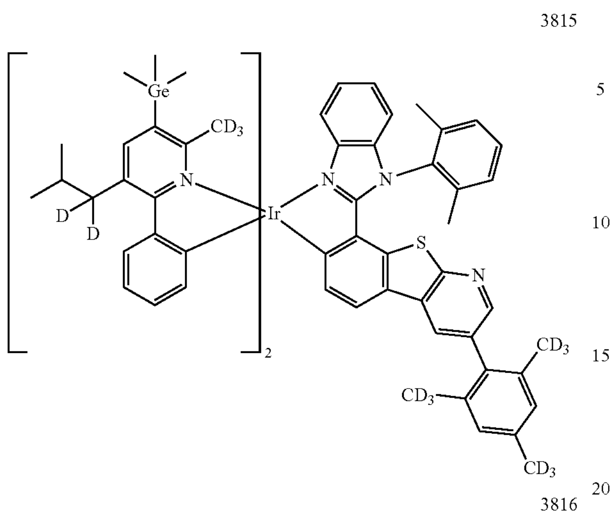
3816
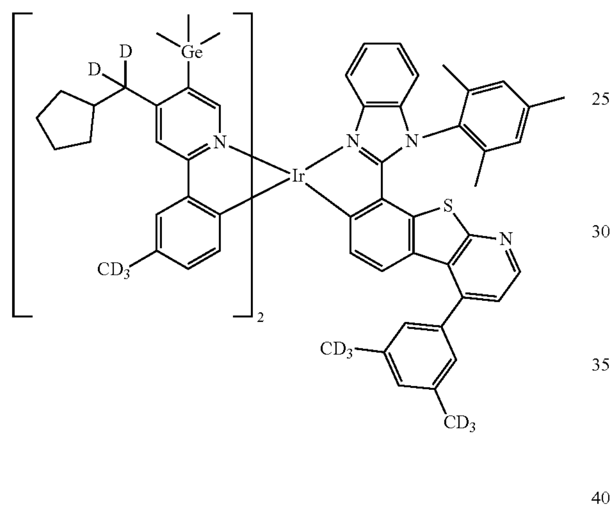
3817
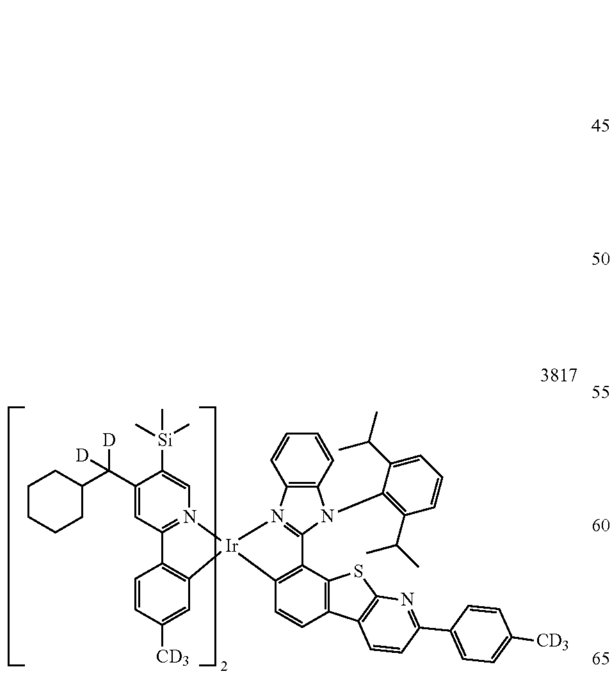
-continued
3818
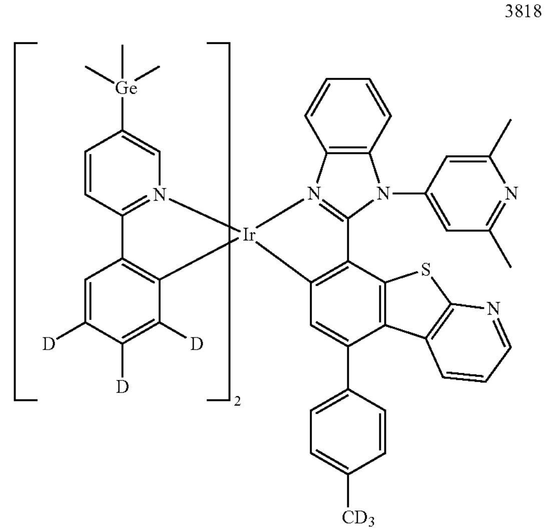
3819
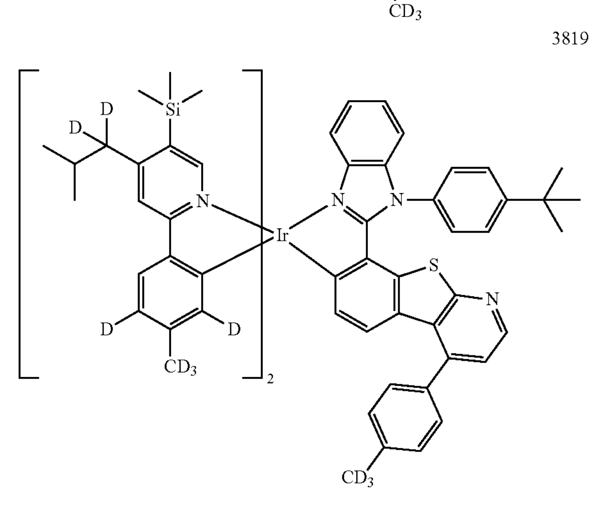
3820
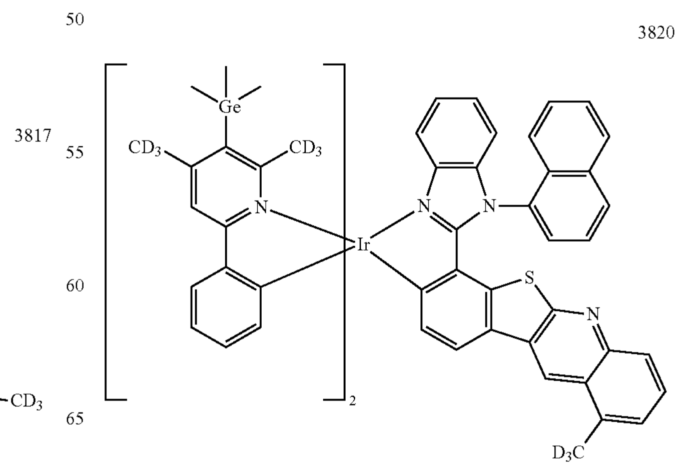

-continued
3821
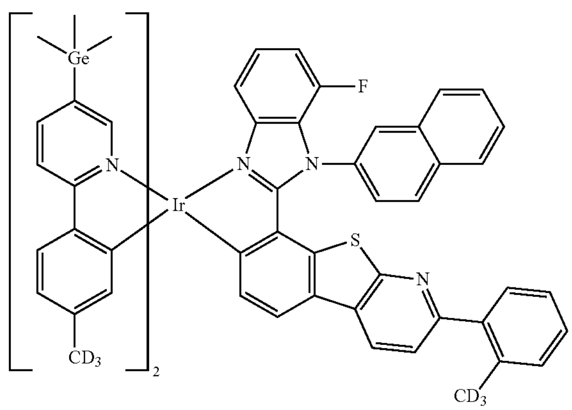
3822
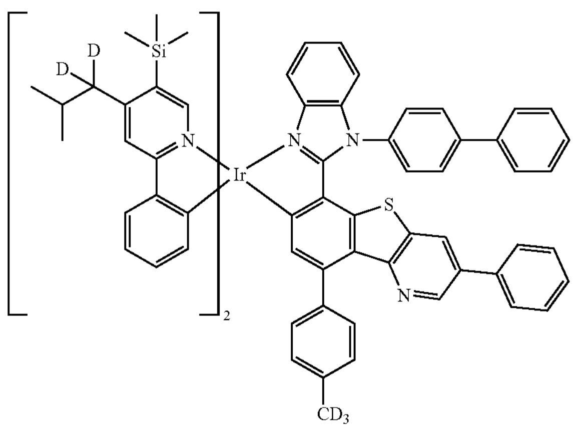
3823
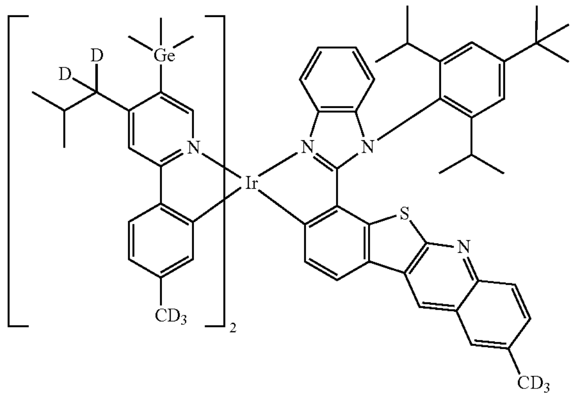
3824
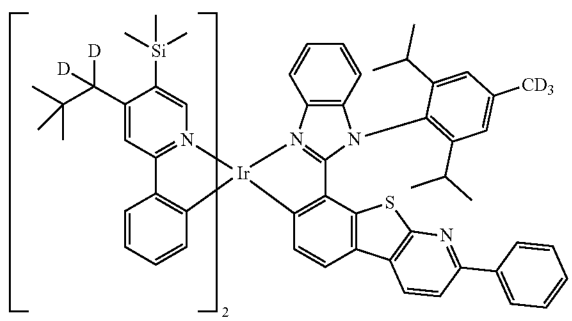
-continued
3825
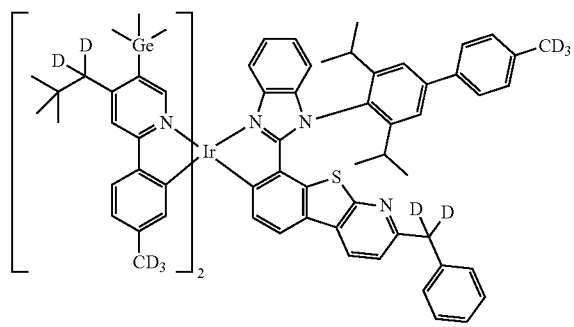
3826
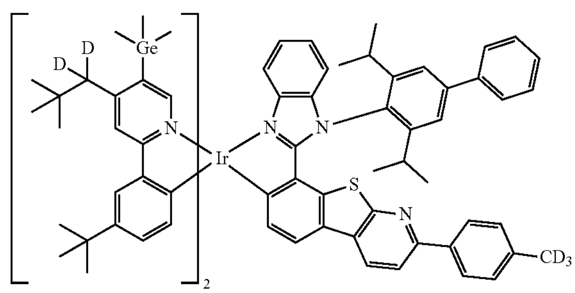
3827
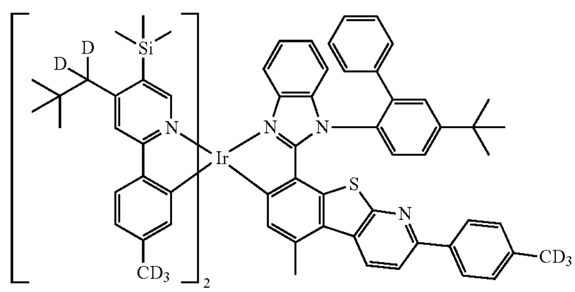
3828
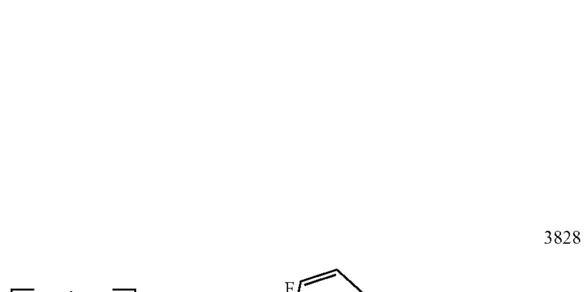

-continued
3829
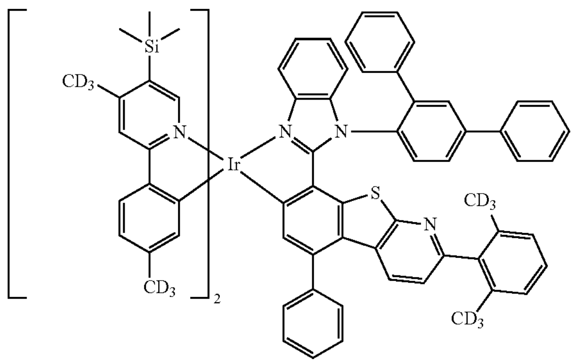
3830
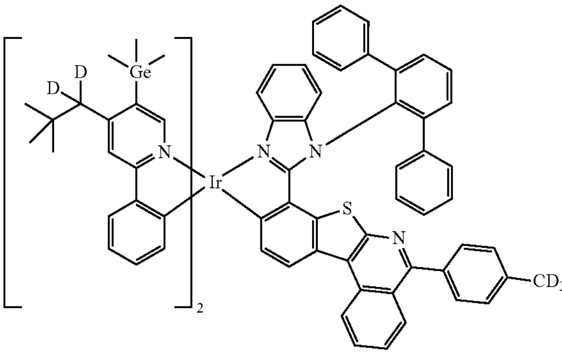
3831
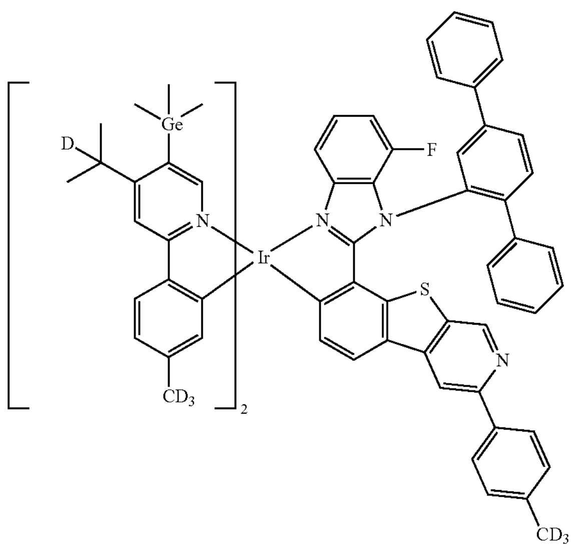
-continued
3832
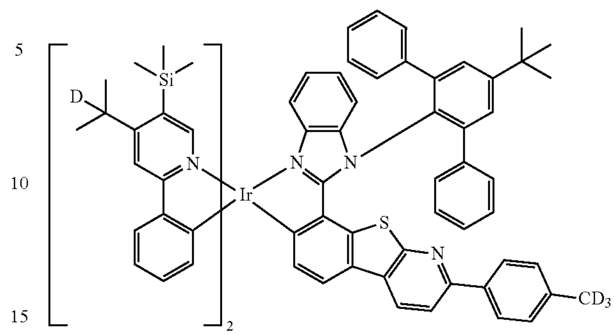
3833
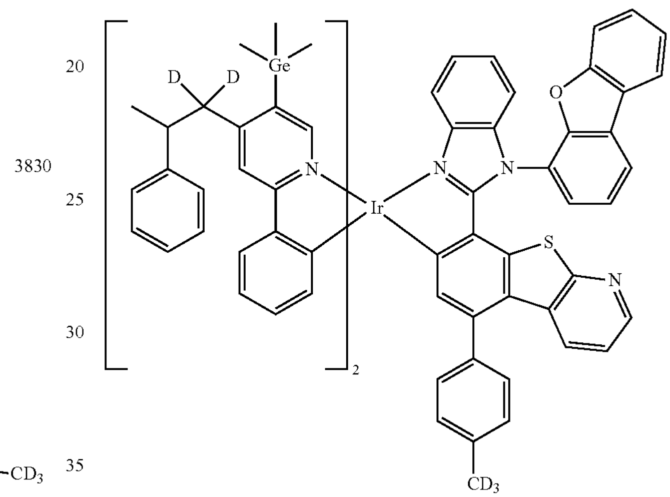
3834
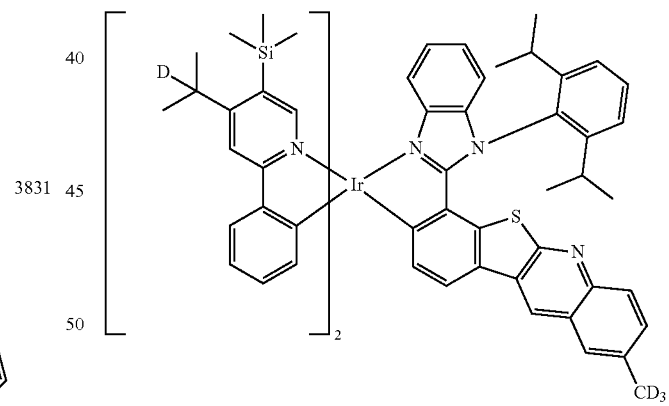
3835
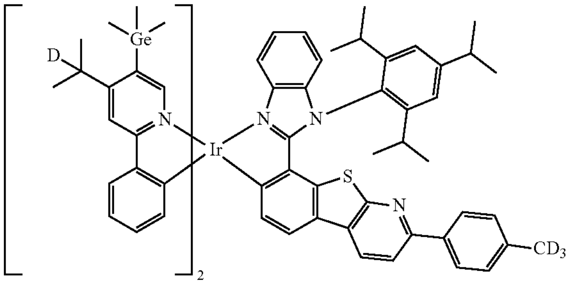

3836
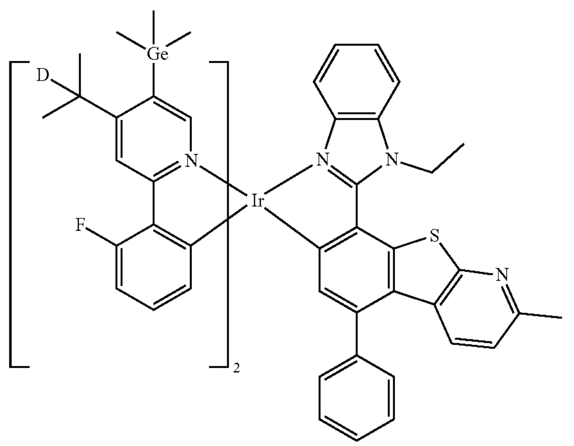
3837
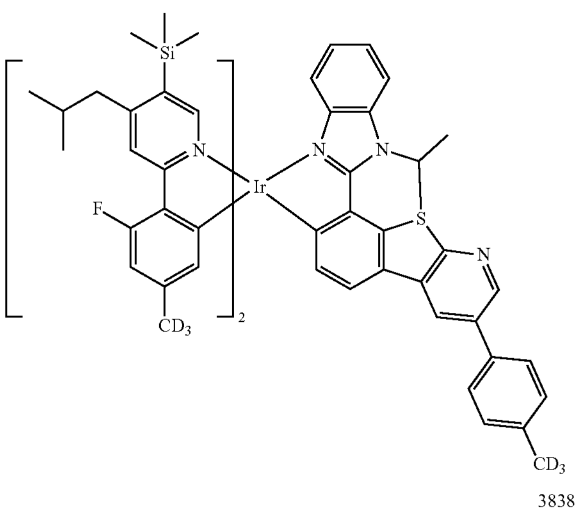
3838
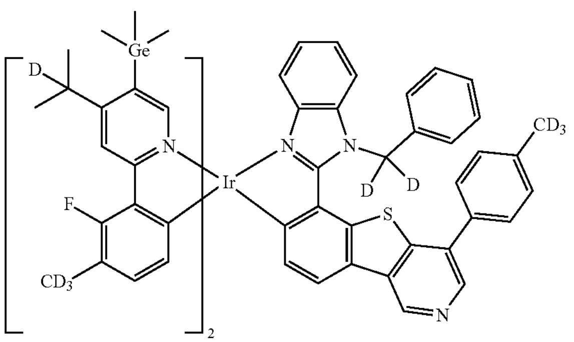
3839
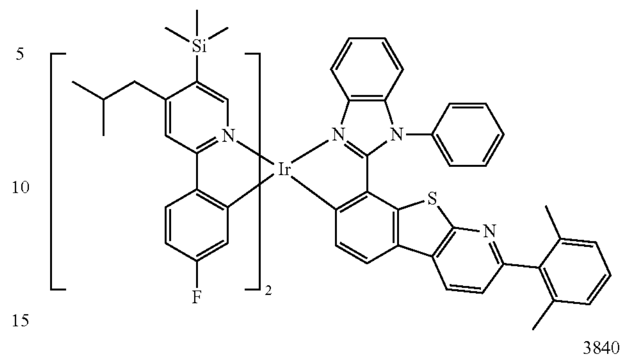
3840
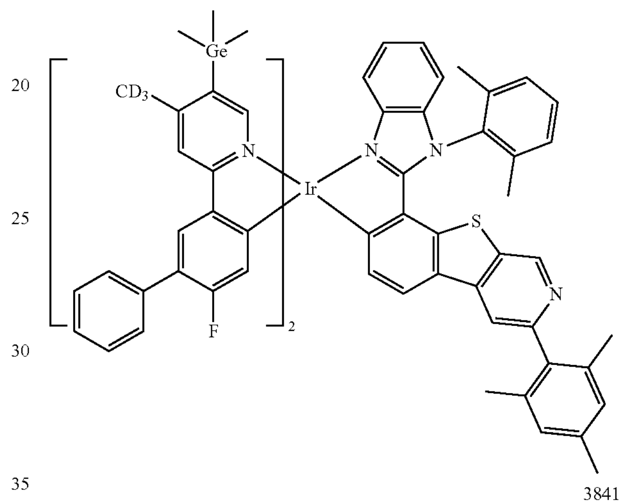
3841
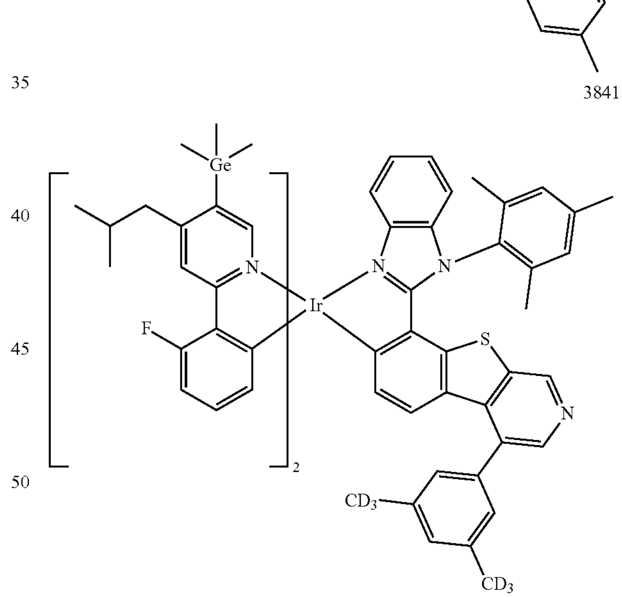
3842
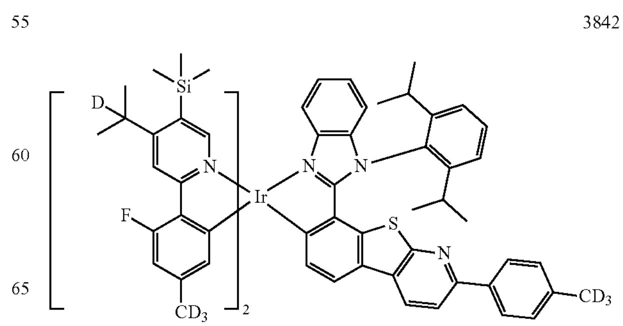

-continued
3843
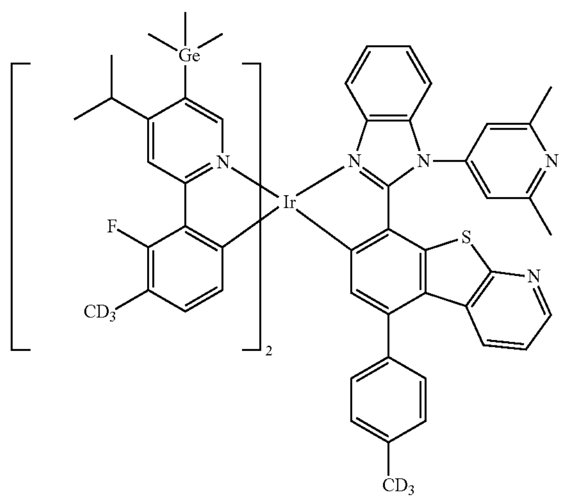
3844
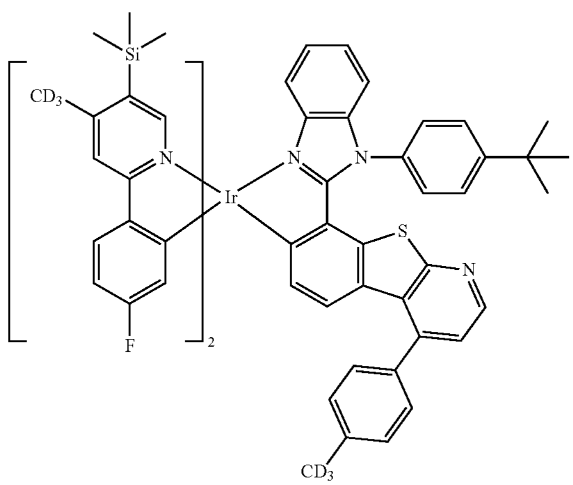
3845
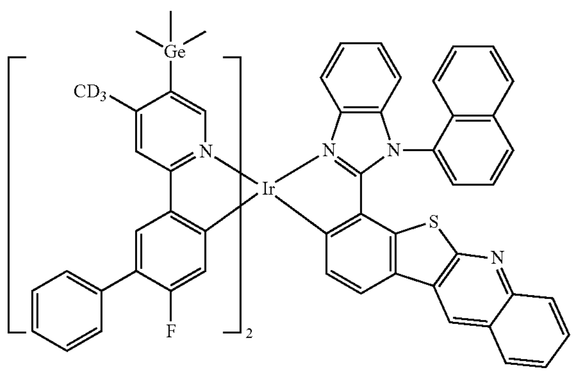
-continued
3846
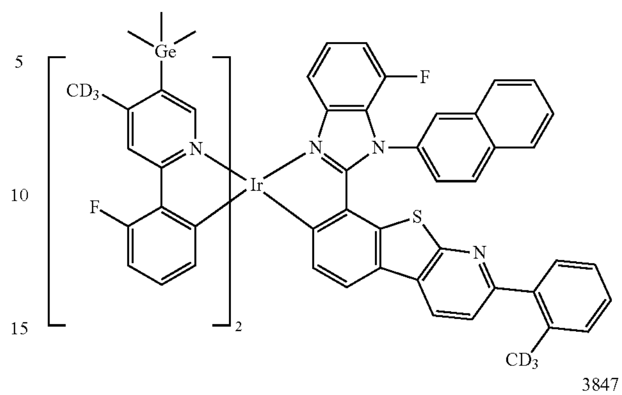
3847
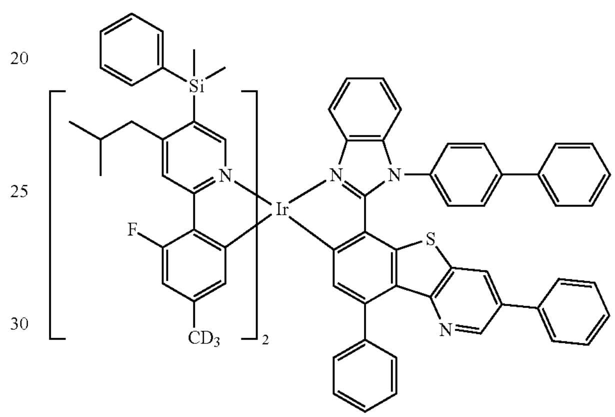
3848
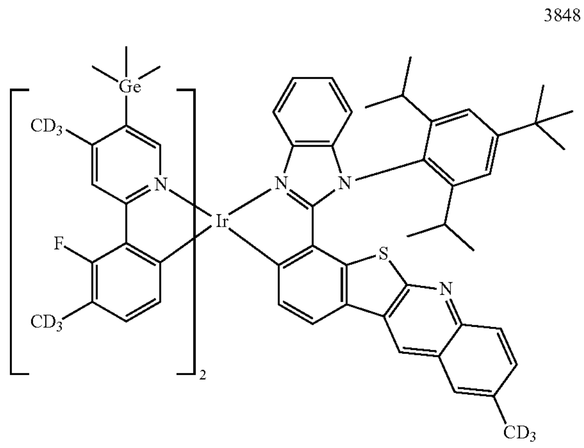
3849
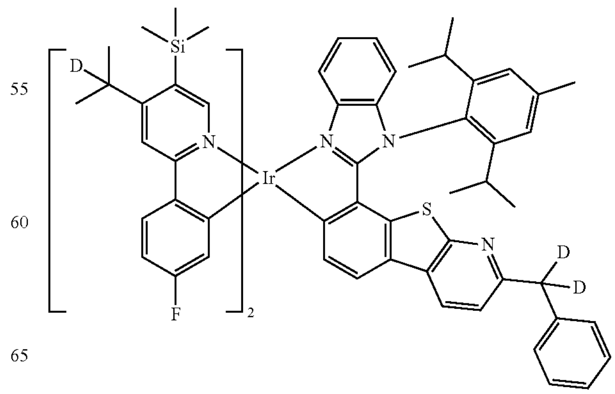

3850
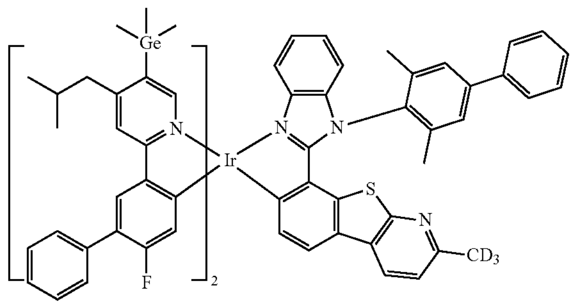
3851
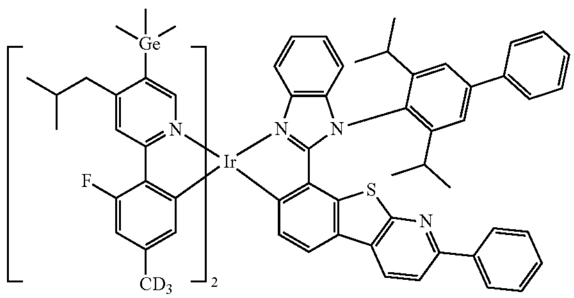
3852
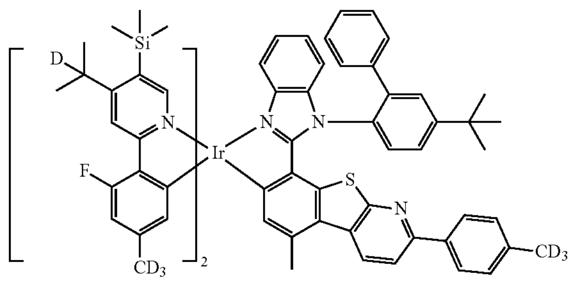
3853
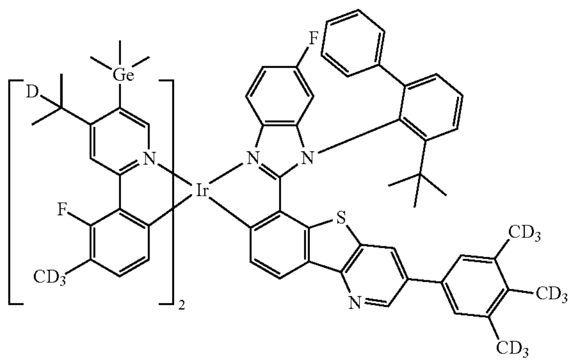
3854
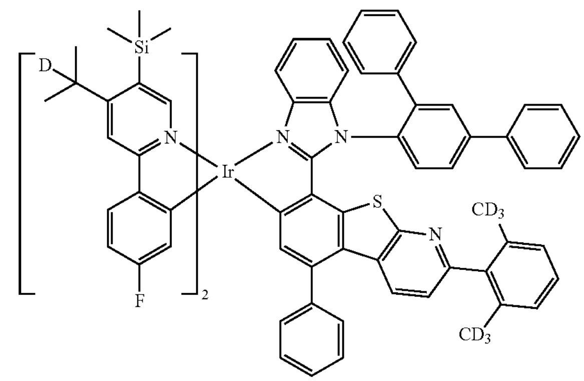
3855
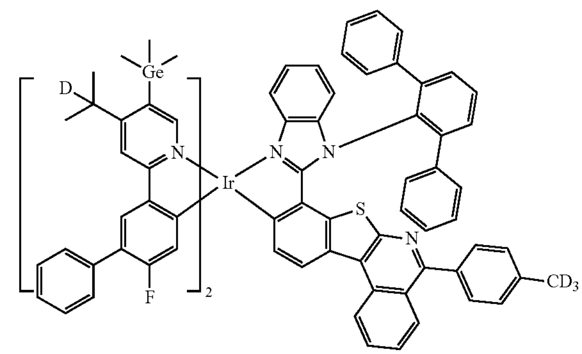
3856
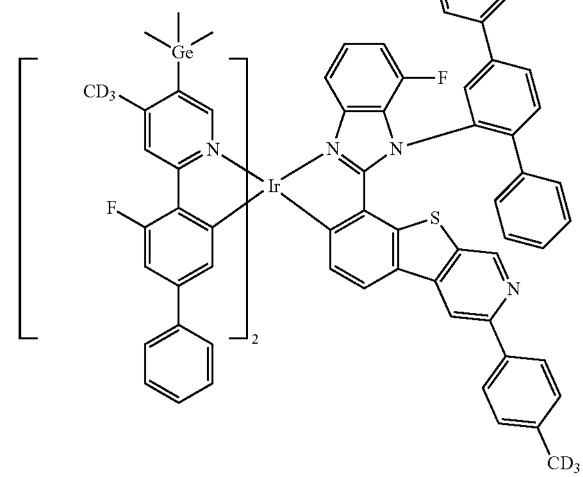

-continued
3857
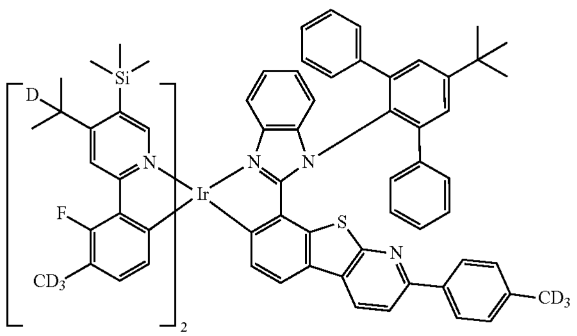
3858
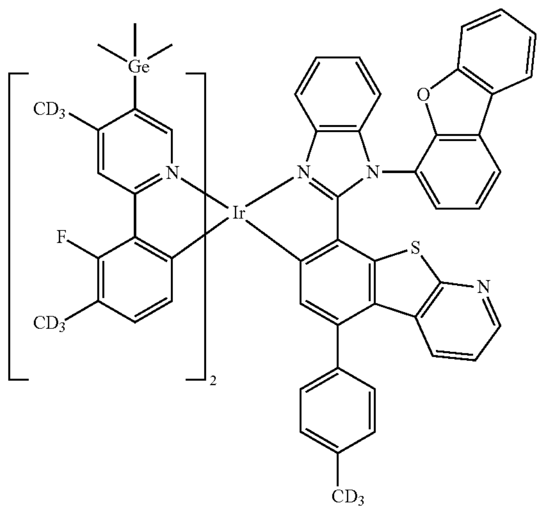
3859
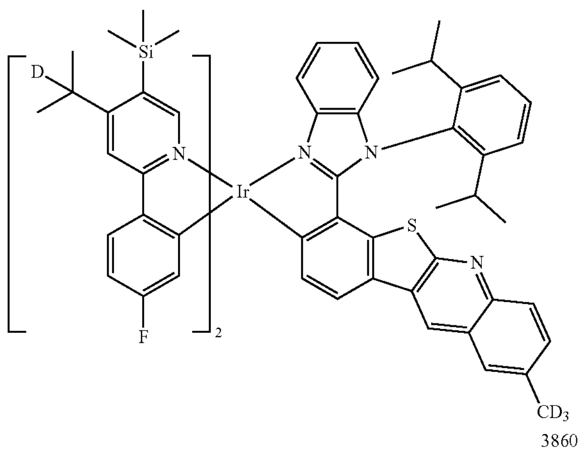
3860
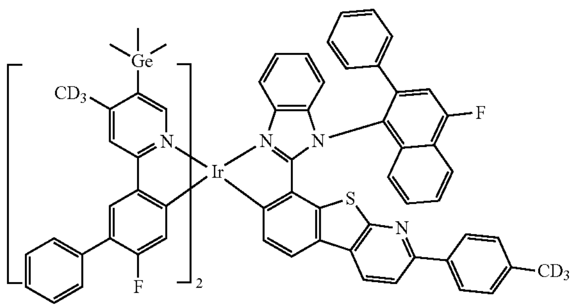
-continued
3861
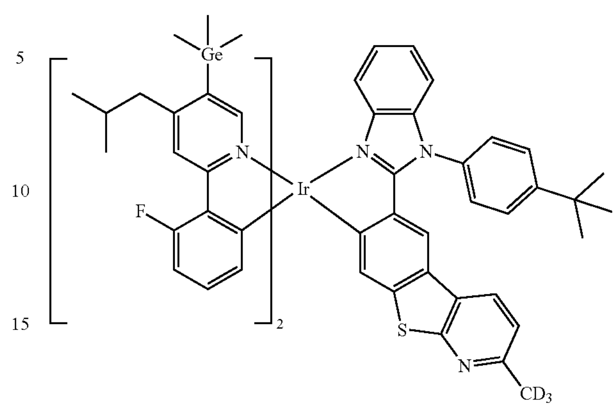
3862
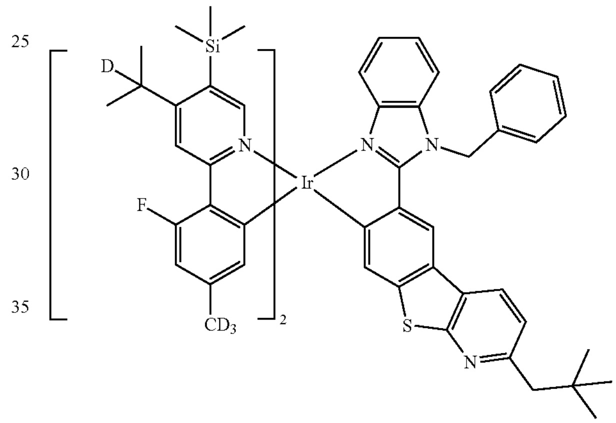
3863
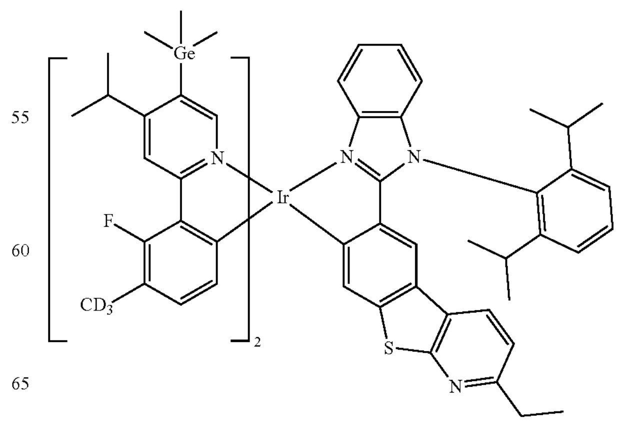

-continued
3864
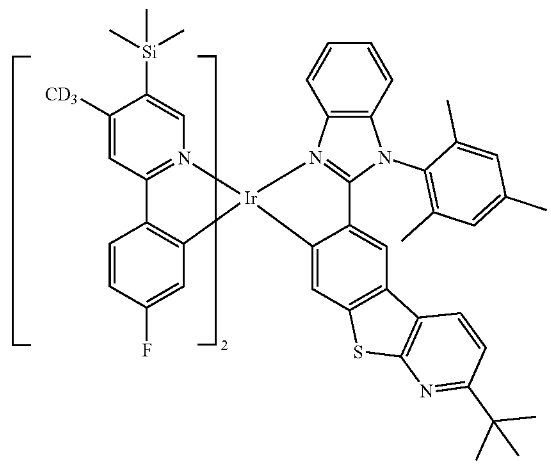
3865
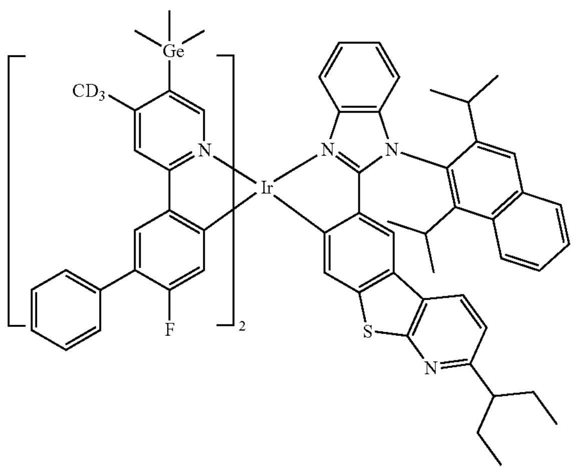
3866
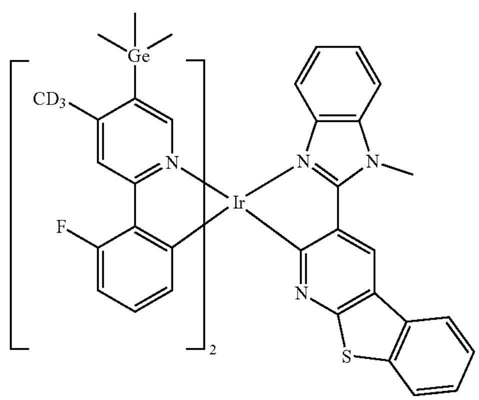
-continued
3867
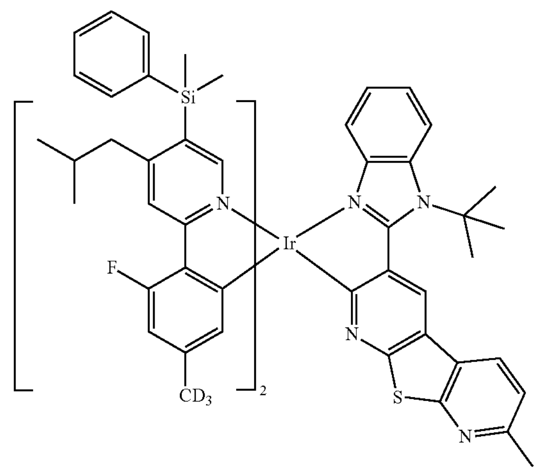
3868
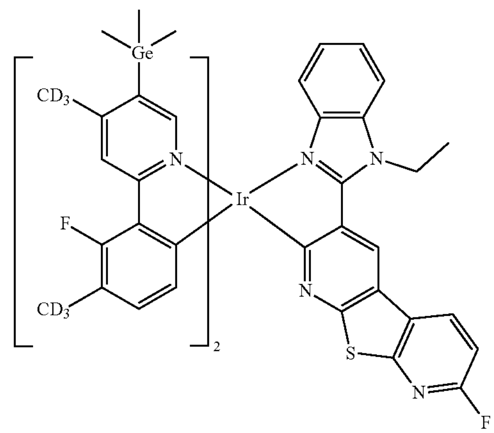
3869
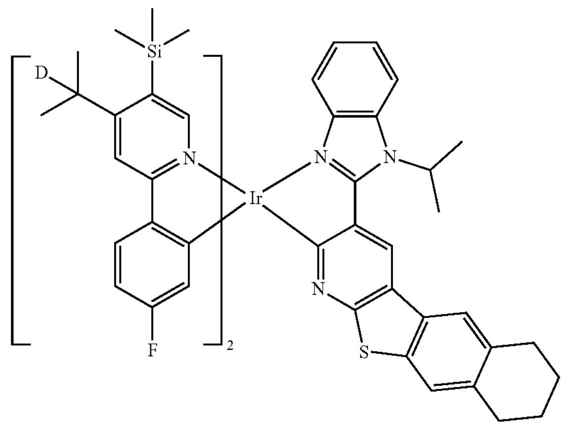

-continued
3870
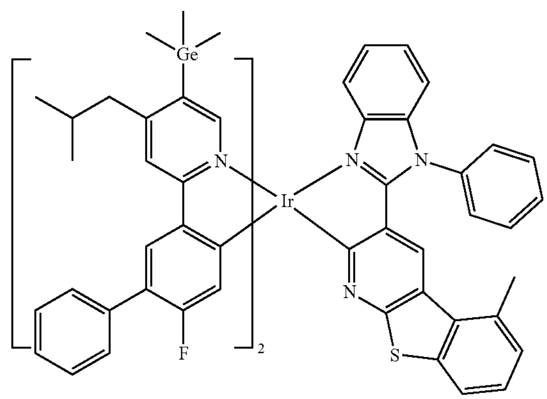
3871
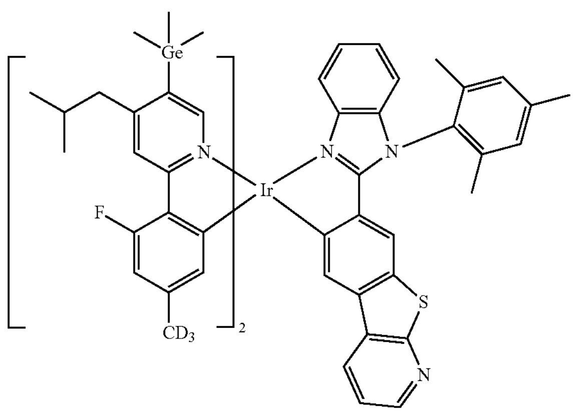
3872
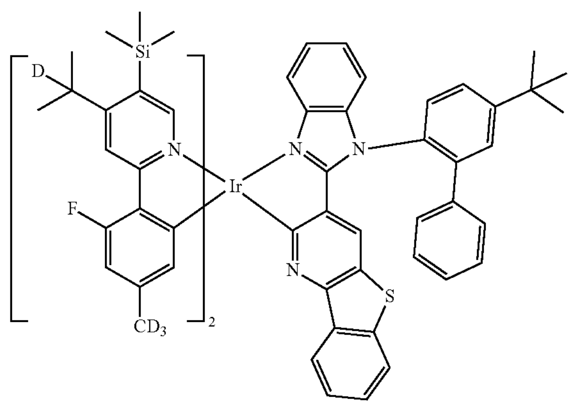
-continued
3873
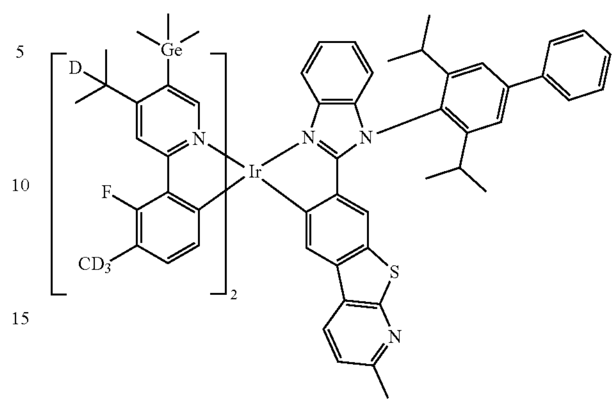
3874
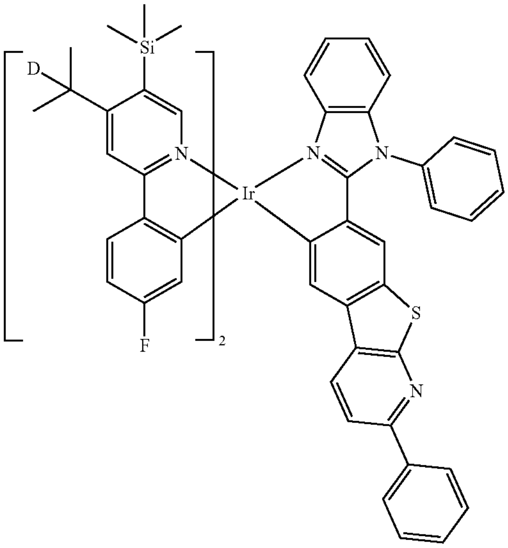
3875
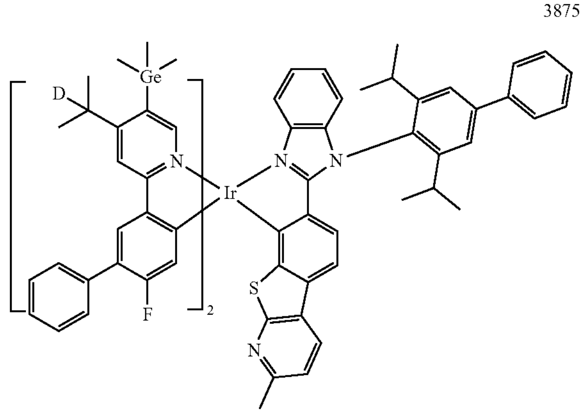

-continued
3876
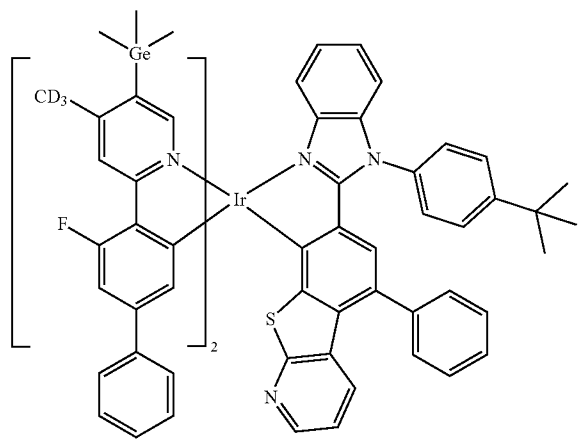
3877
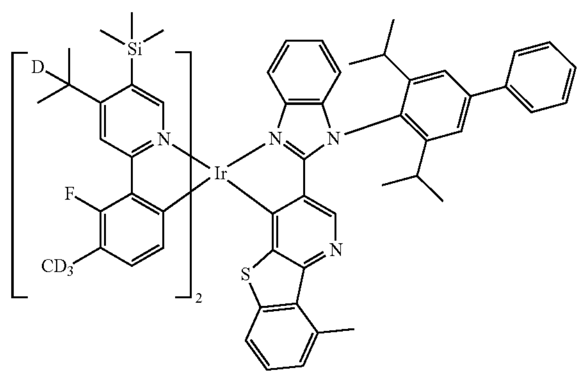
3878
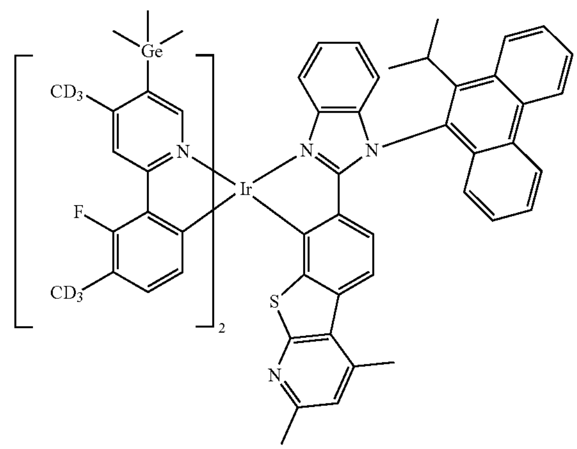
-continued
3879
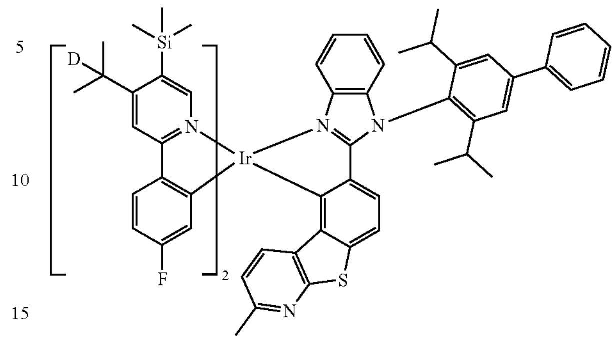
3880
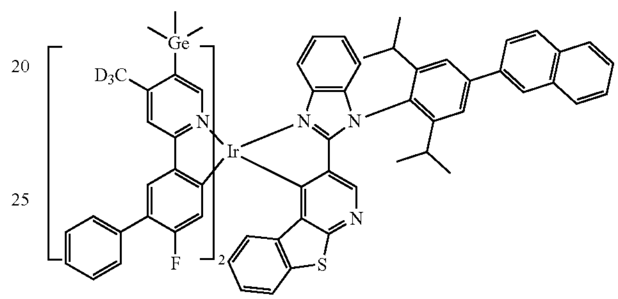
3881
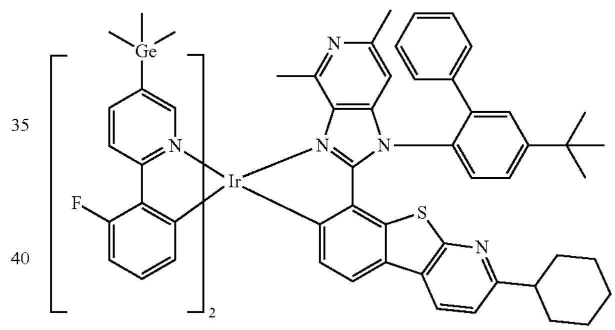
3882
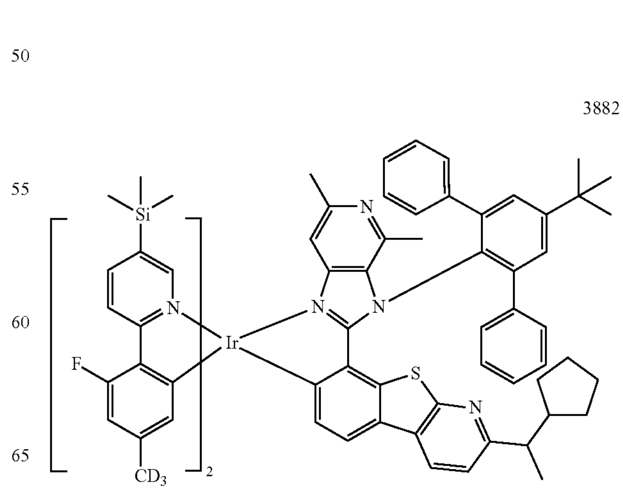

-continued
3883
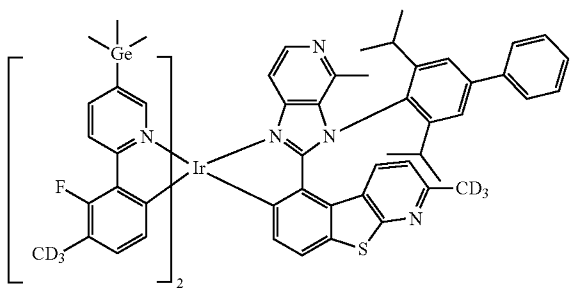
3884
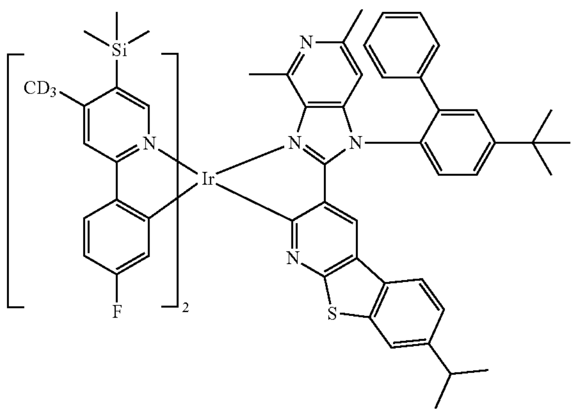
3885
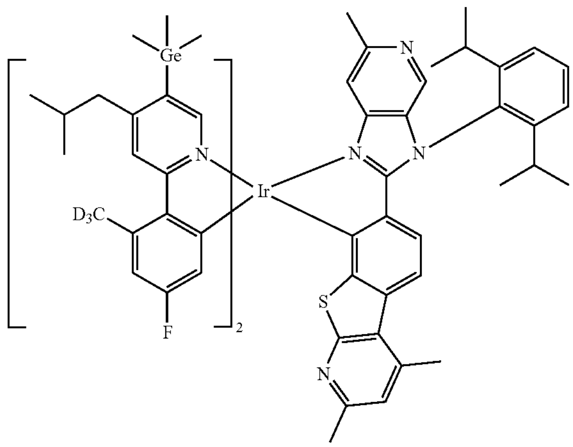
3886
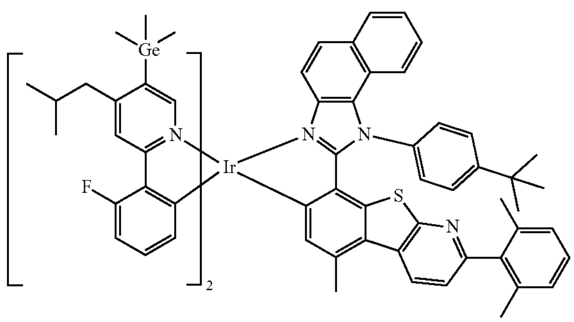
-continued
3887
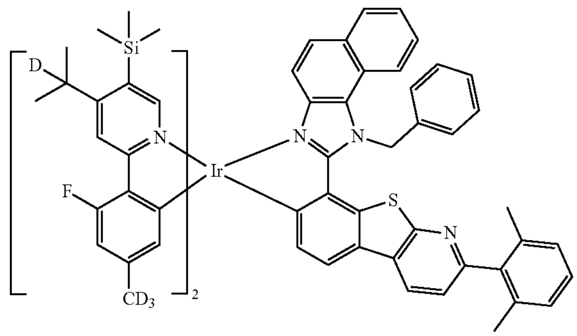
3888
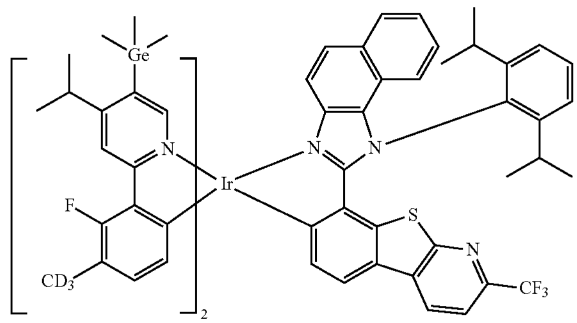
3889
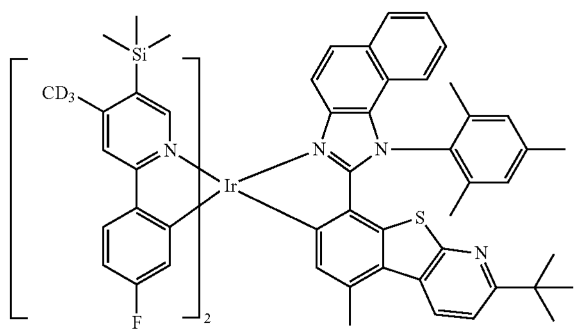
3890
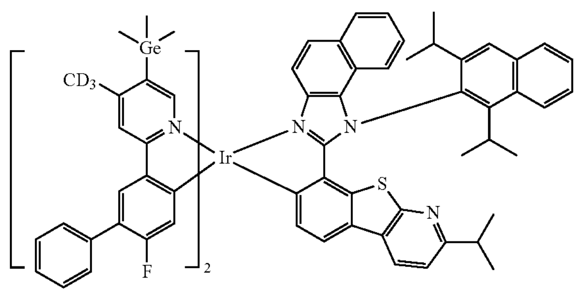

-continued
3891
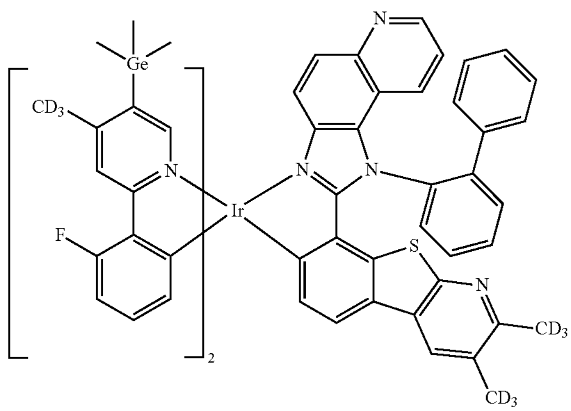
3892
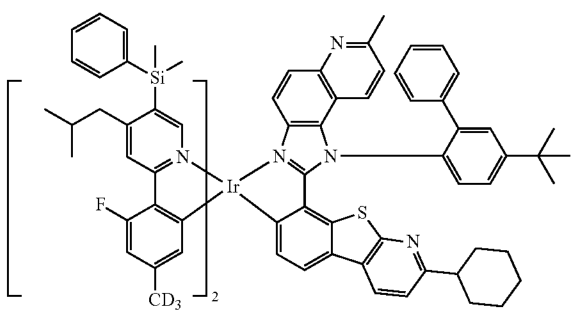
3893
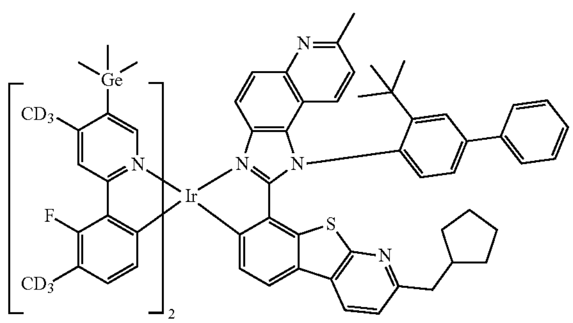
3894
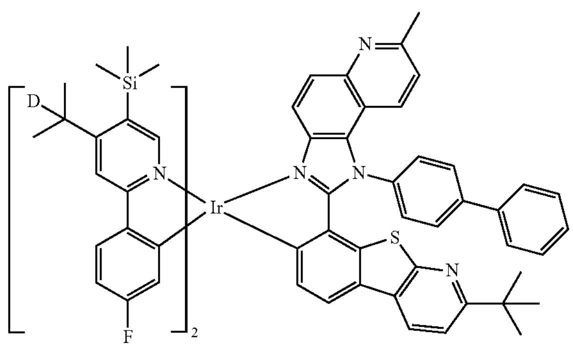
-continued
3895
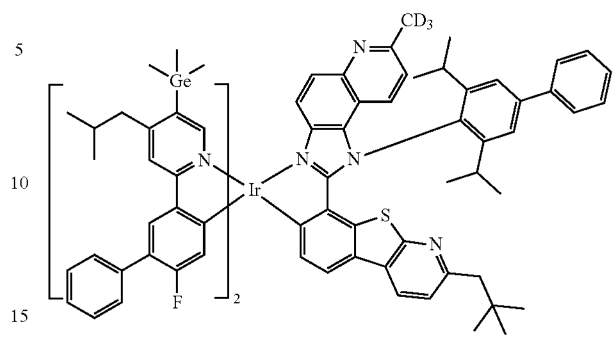
3896
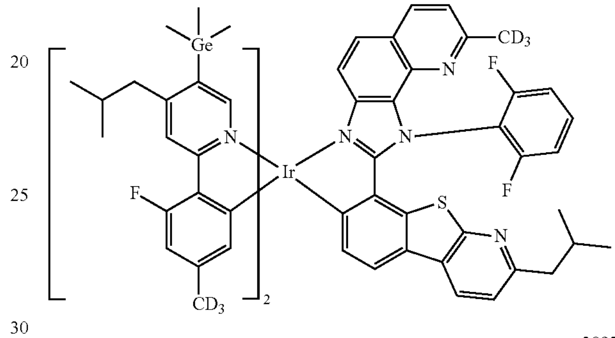
3897
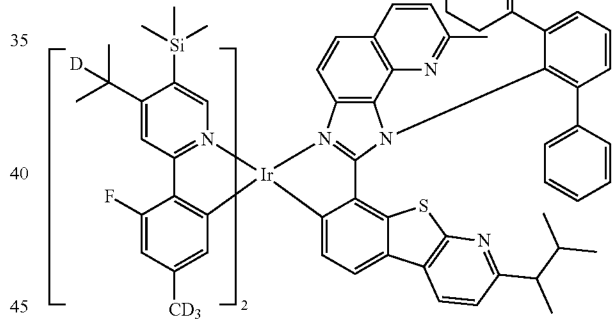
3898
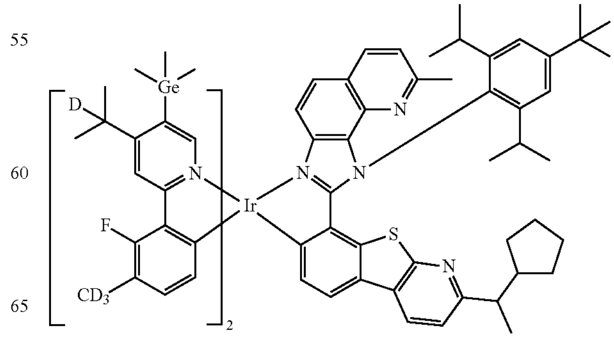

-continued
3899
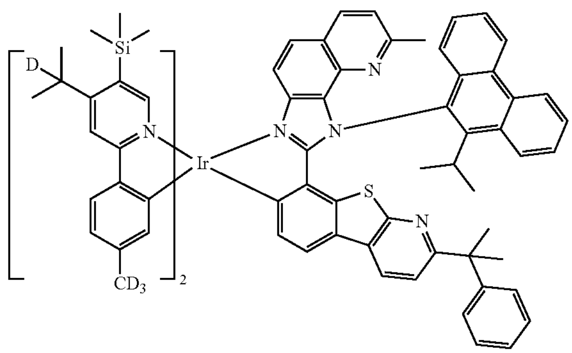
3900
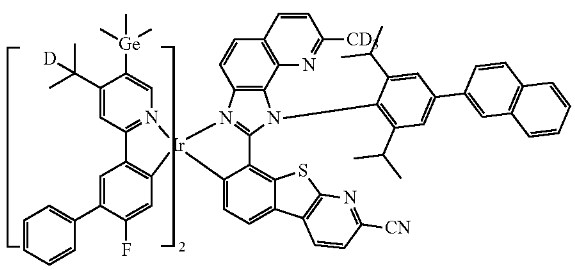
3901
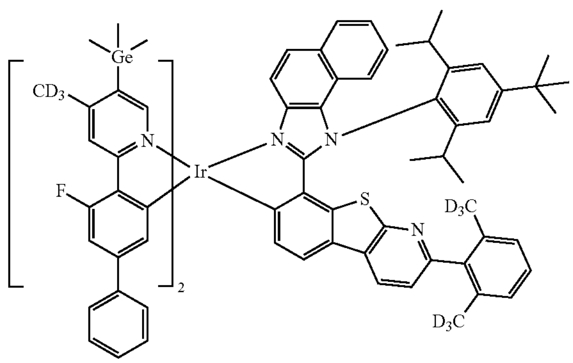
3902
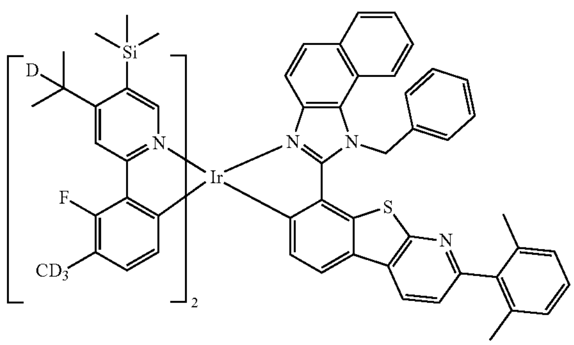
-continued
3903
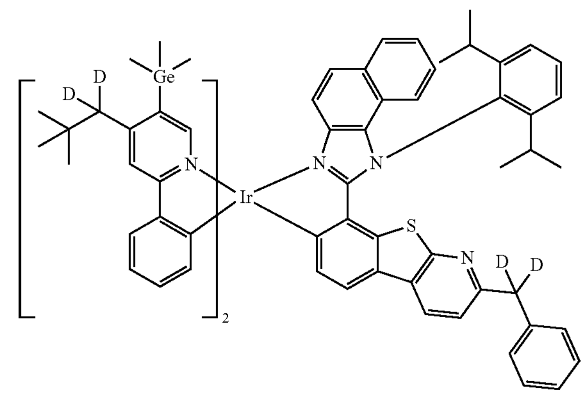
3904
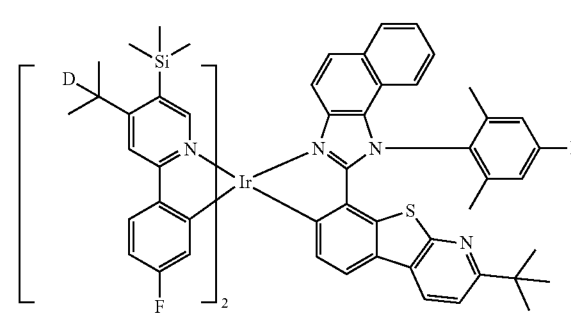
3905
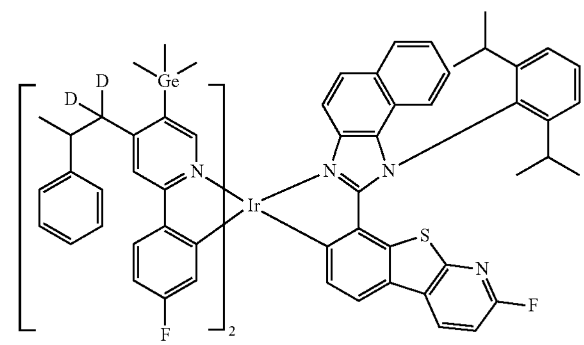
3906
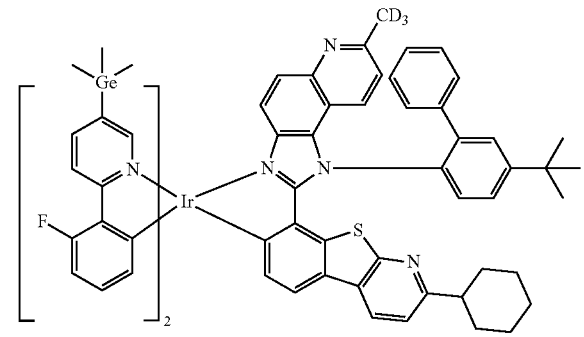

-continued
3907
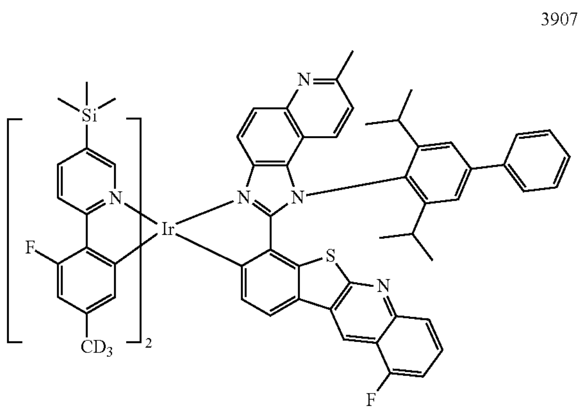
3908
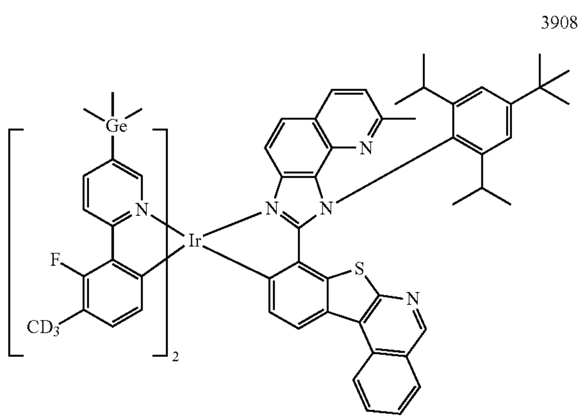
3909
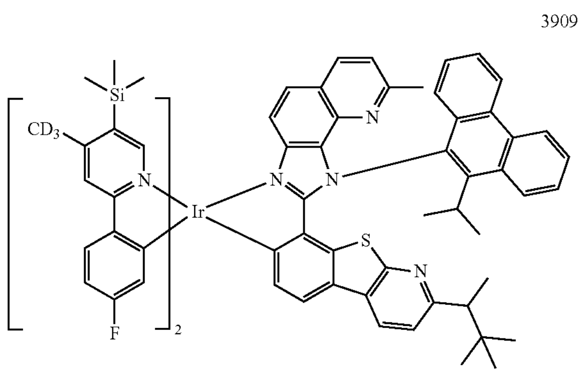
3910
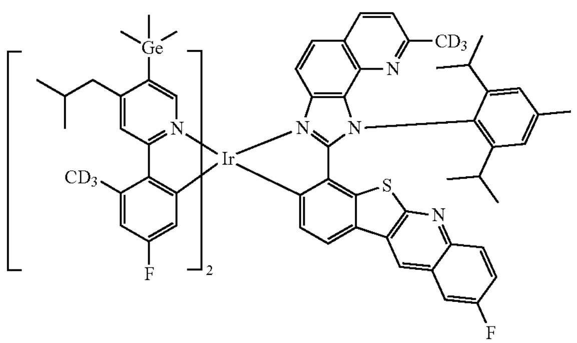
-continued
3911
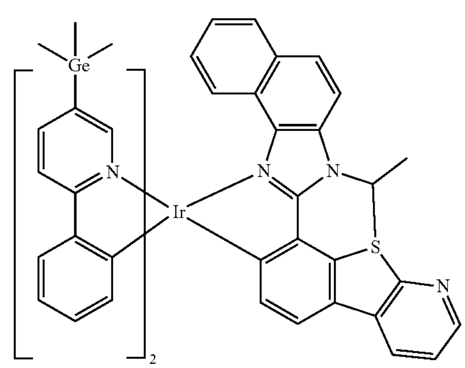
3912
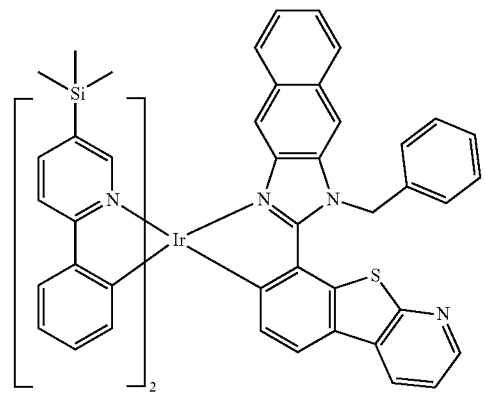
3913
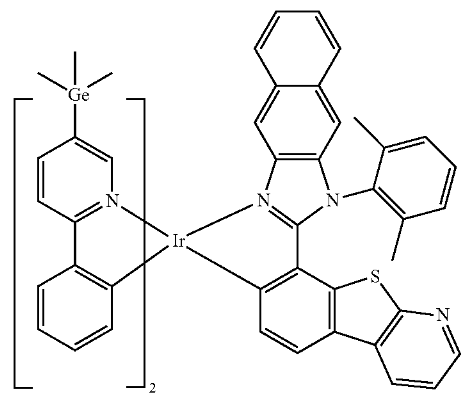
3914
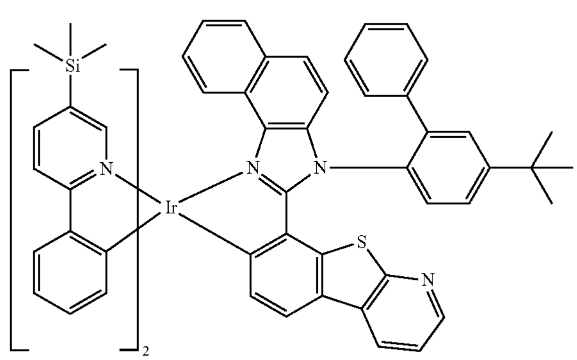

-continued
3915
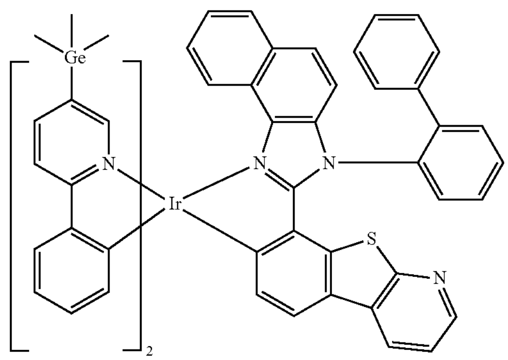
3916
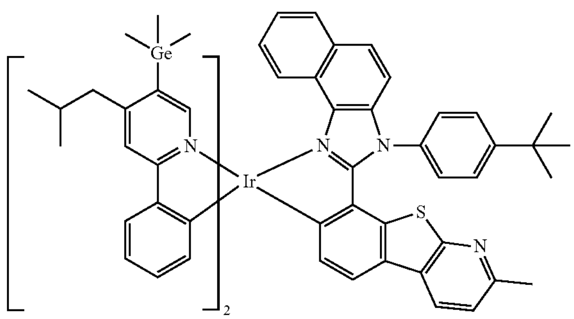
3917
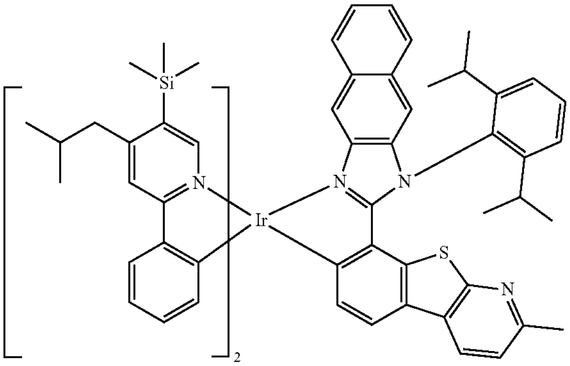
3918
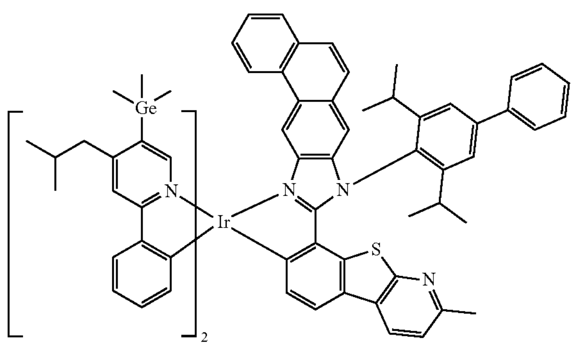
-continued
3919
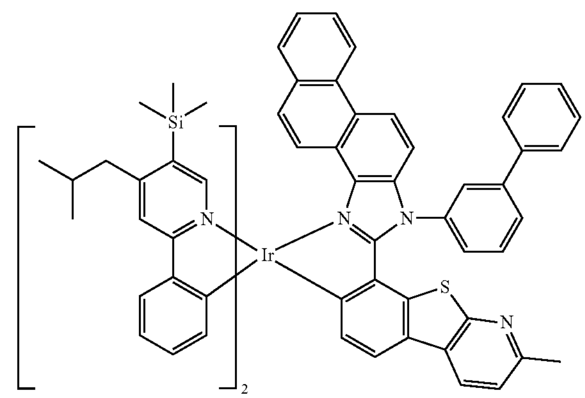
3920
3921
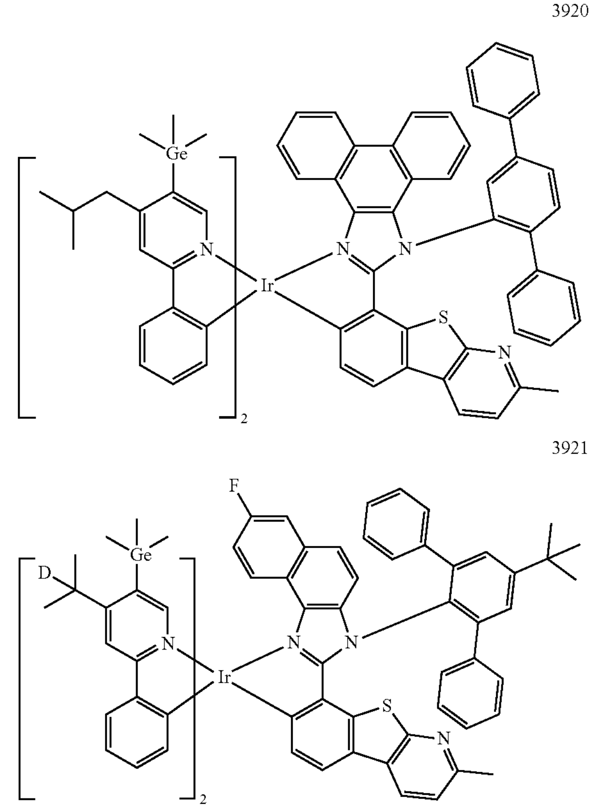
3922
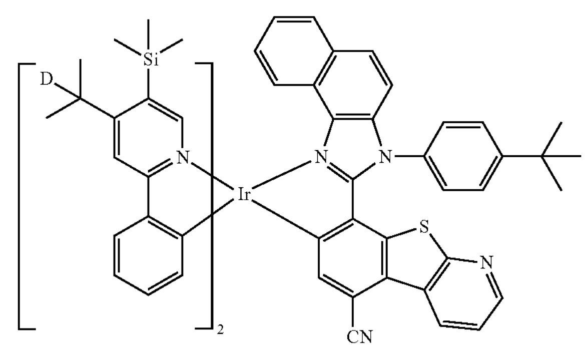

-continued
3923
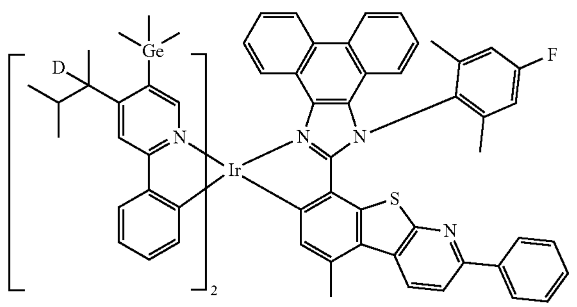
3924
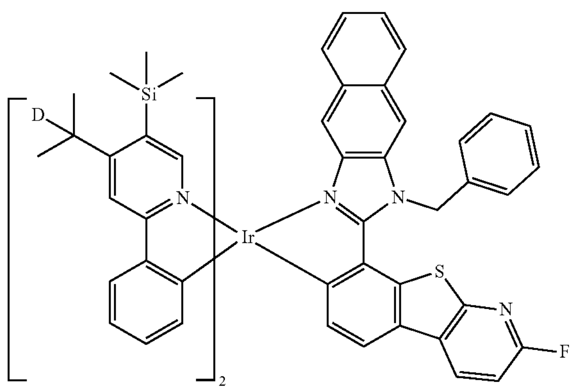
3925
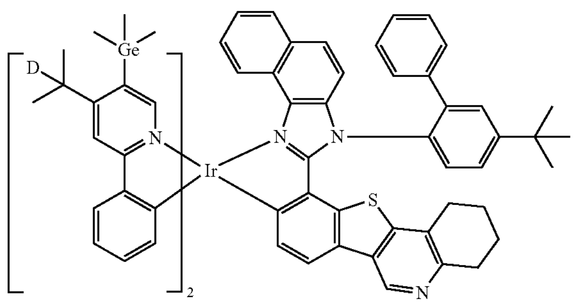
3926
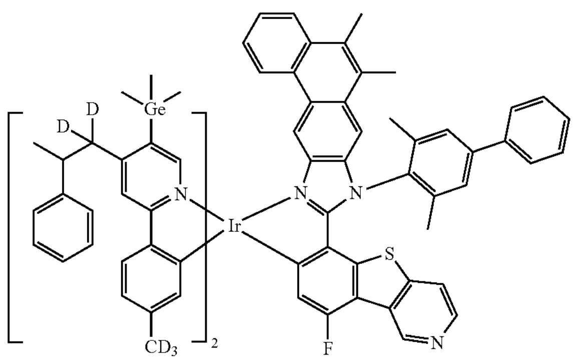
-continued
3927
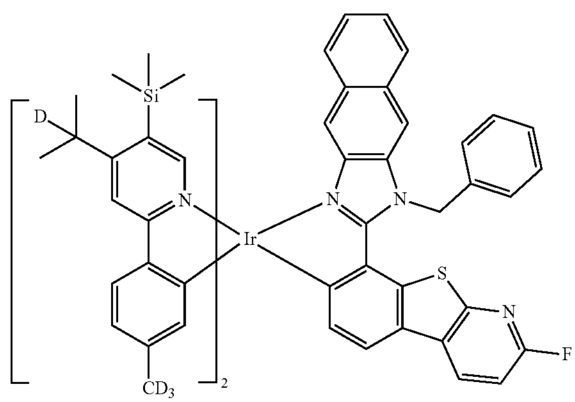
3928
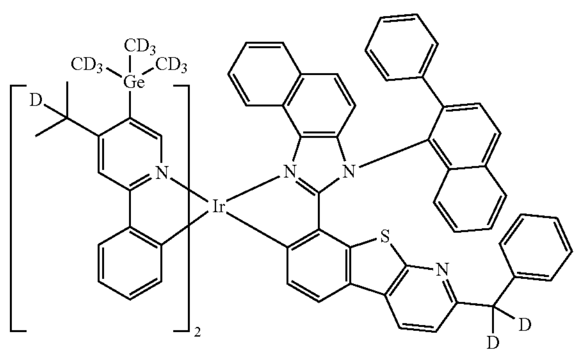
3929
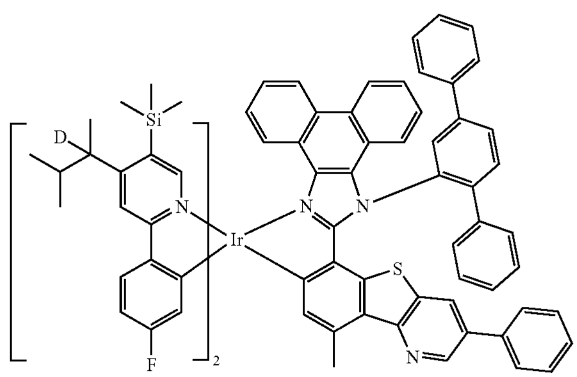
3930
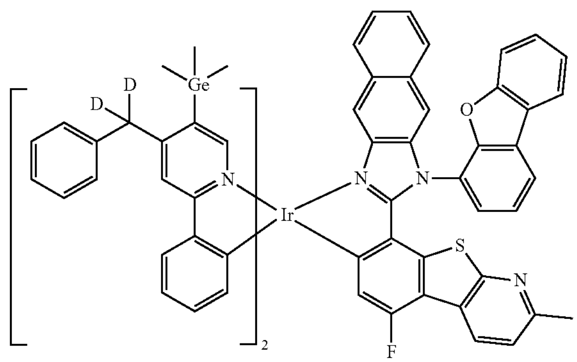

-continued
3931
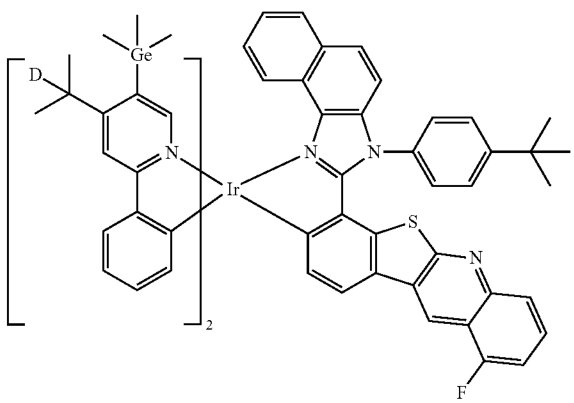
3932
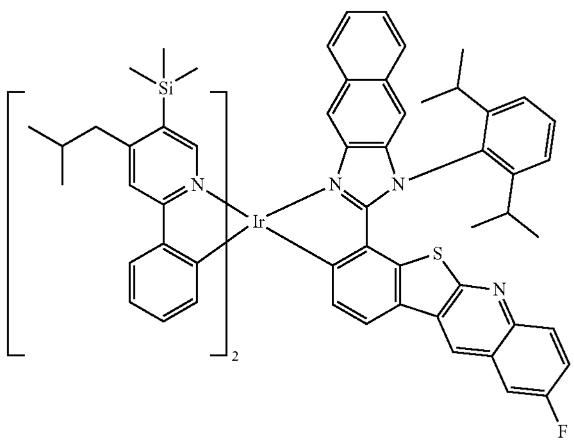
3933
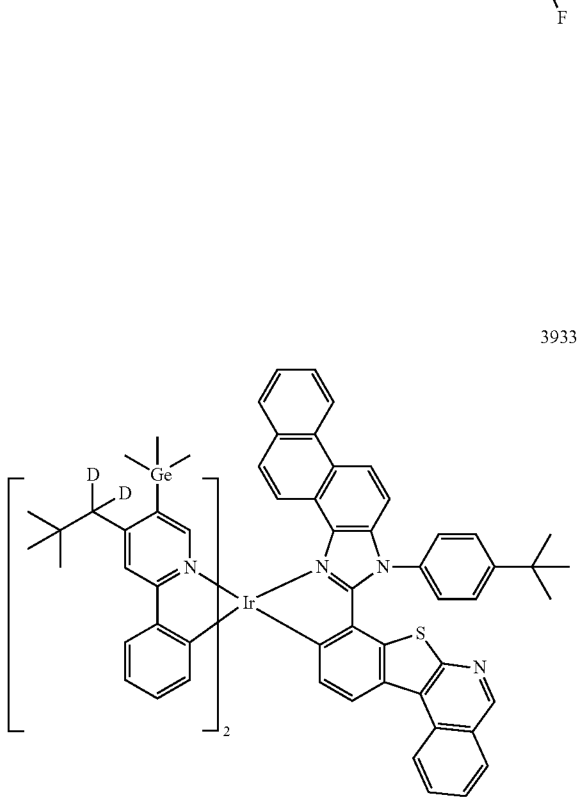
-continued
3934
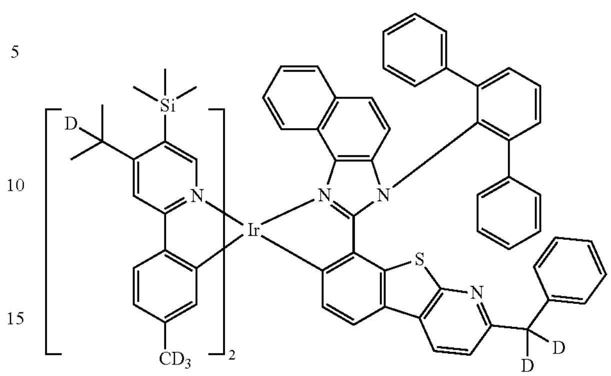
3935
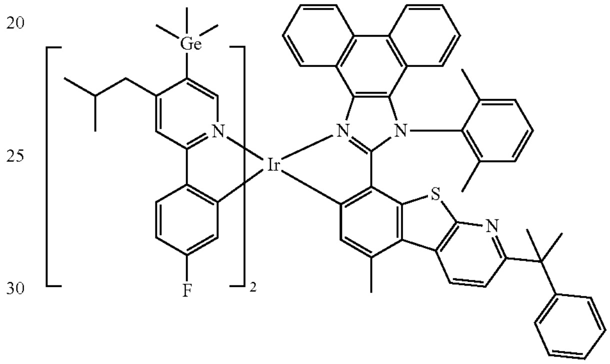
3936
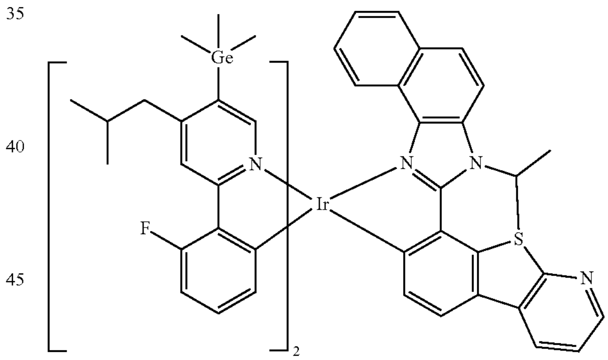
3937
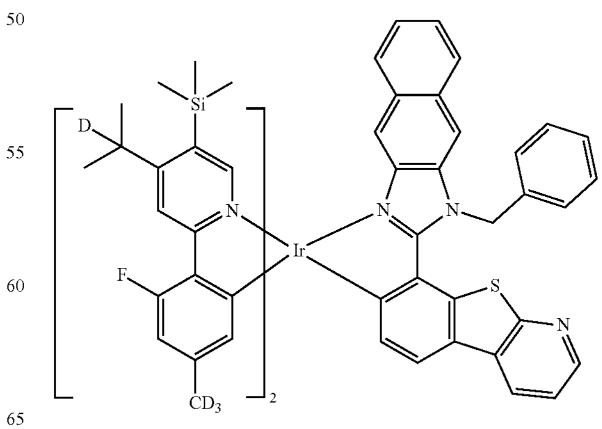

-continued
3938
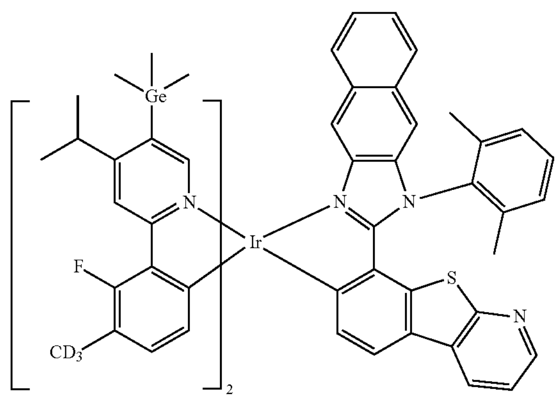
3939
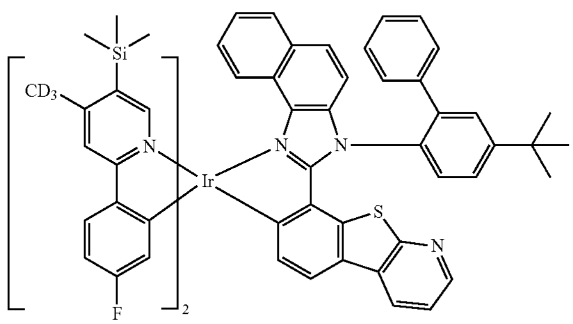
3940
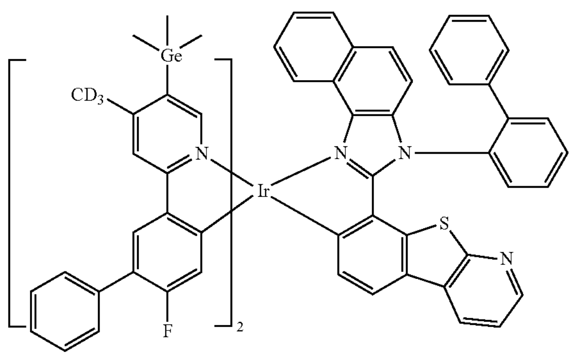
3941
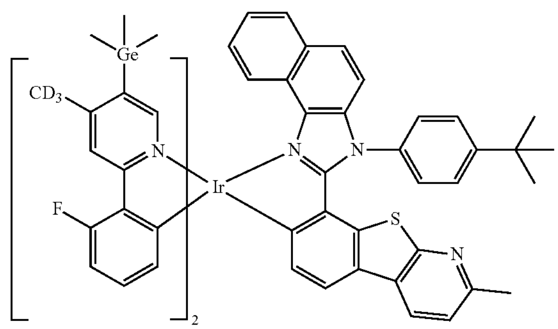
-continued
3942
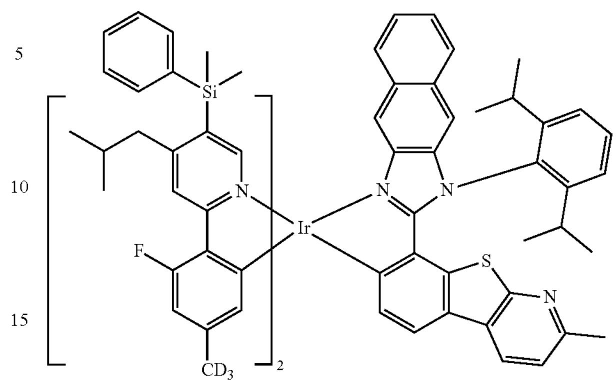
3943
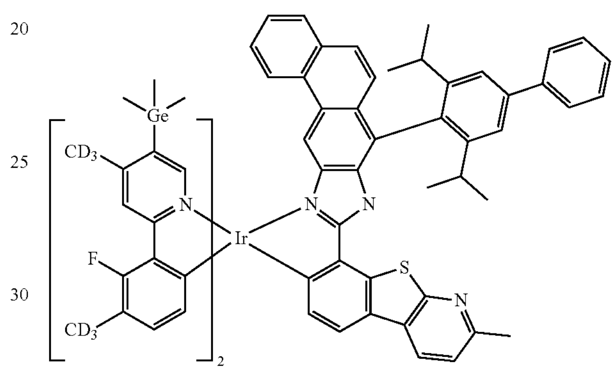
3944
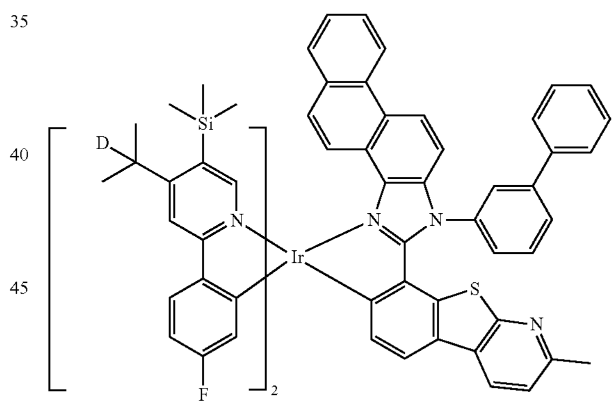
3945
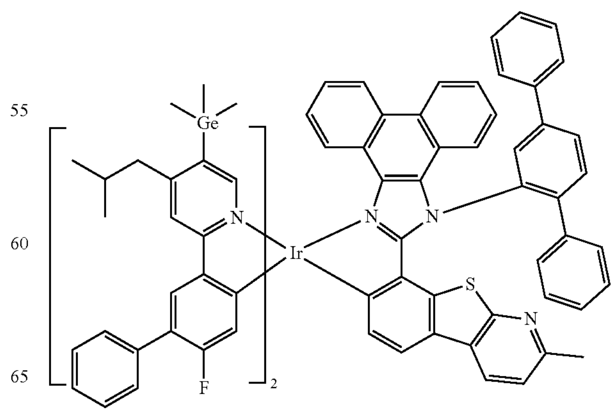

-continued
3946
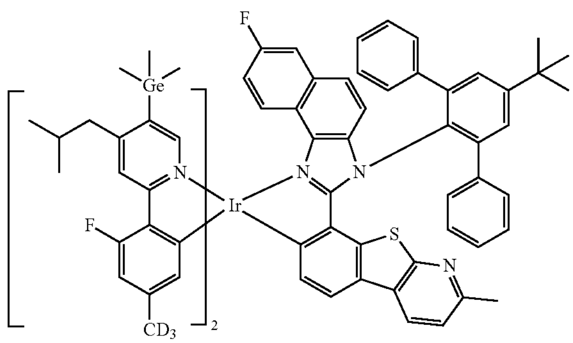
3947
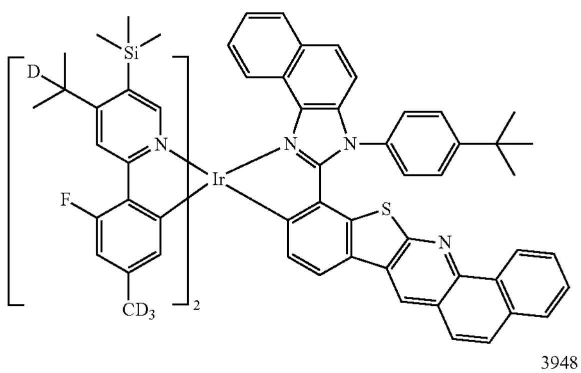
3948
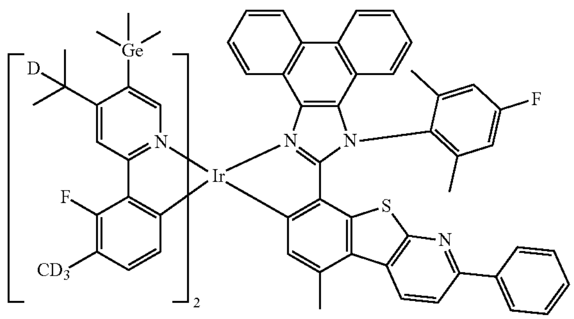
3949
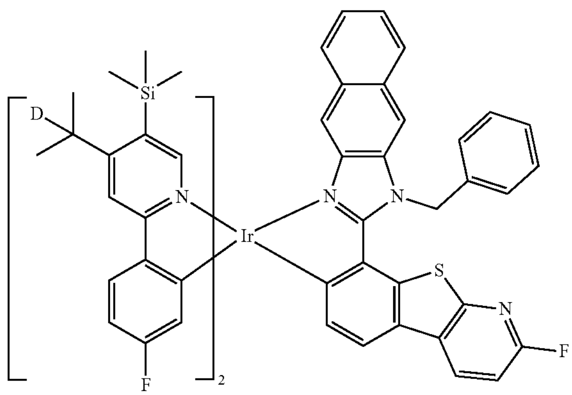
-continued
3950
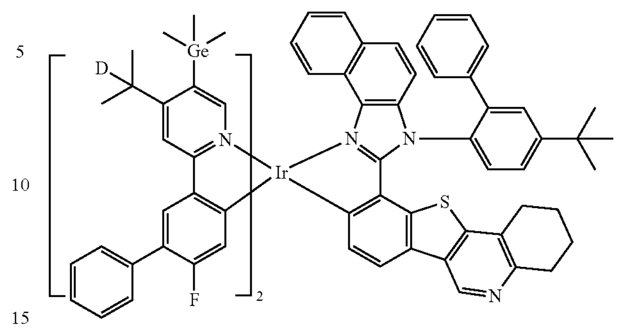
3951
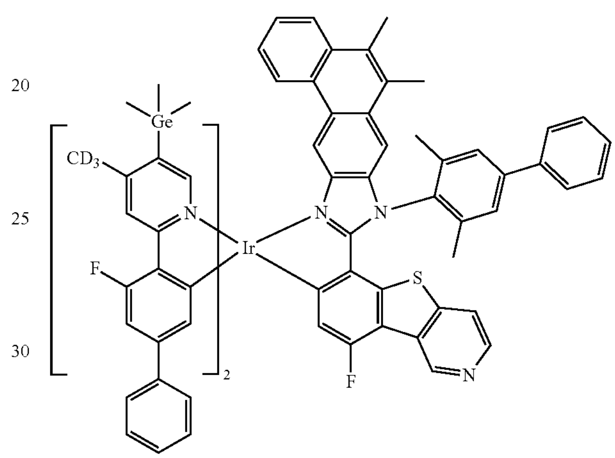
3952
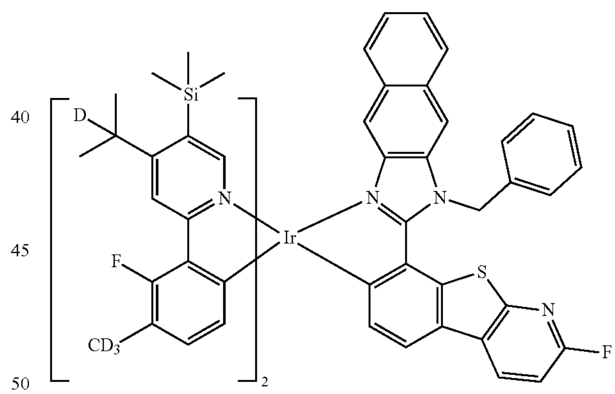
3953
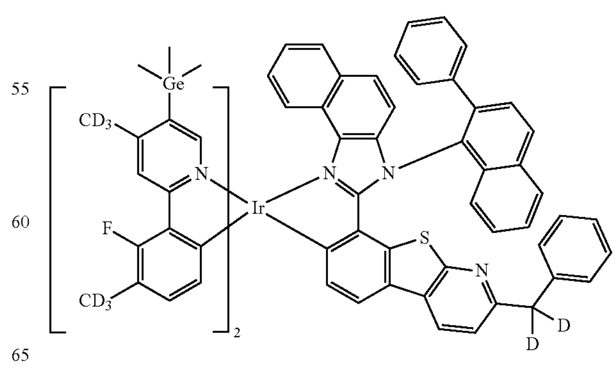

-continued
3954
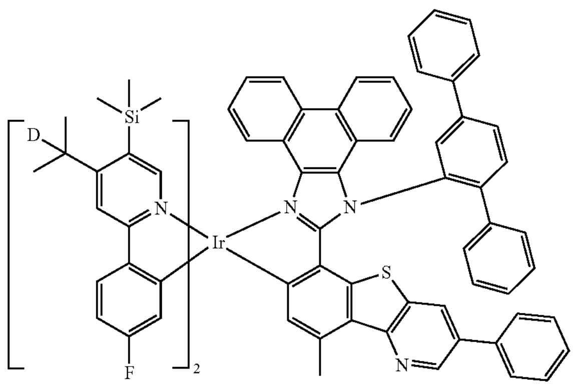
3955
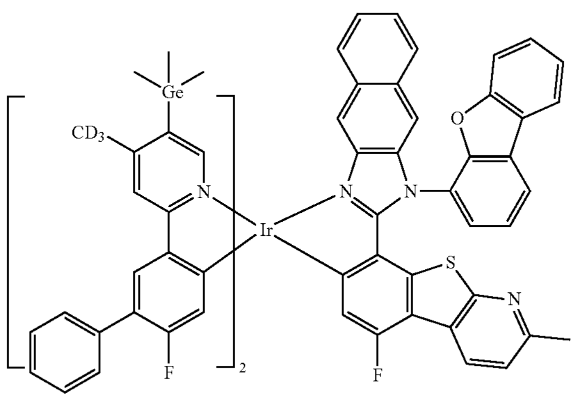
3956
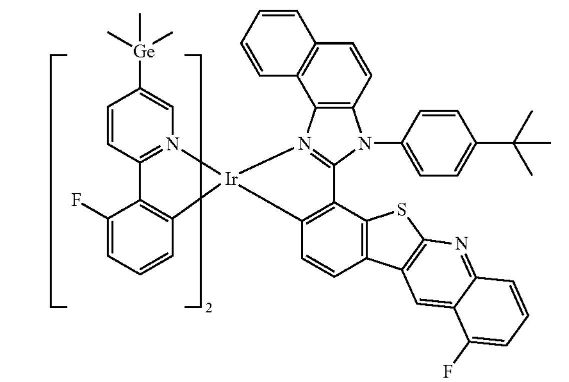
3957
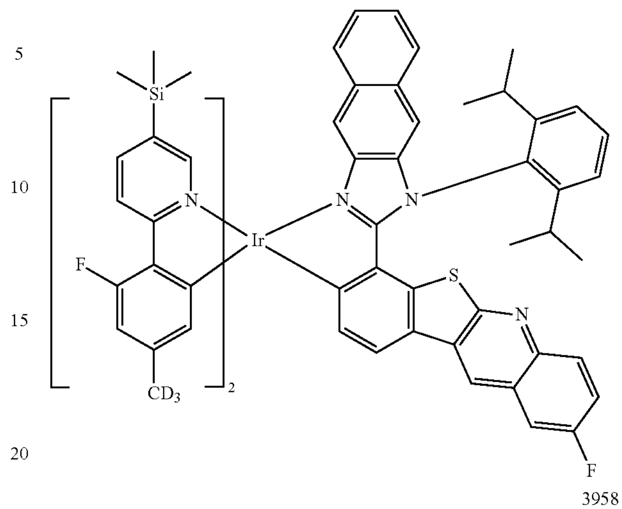
3958
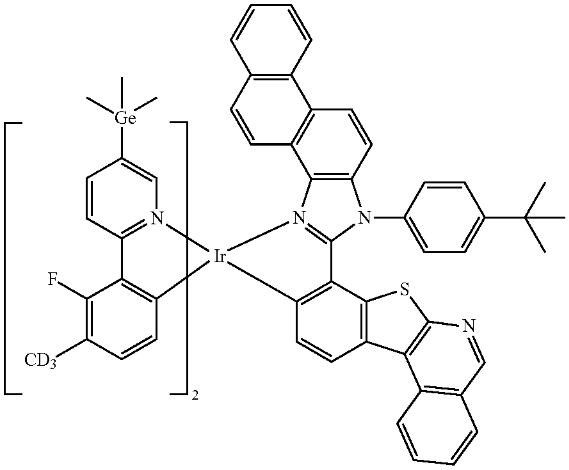
3959
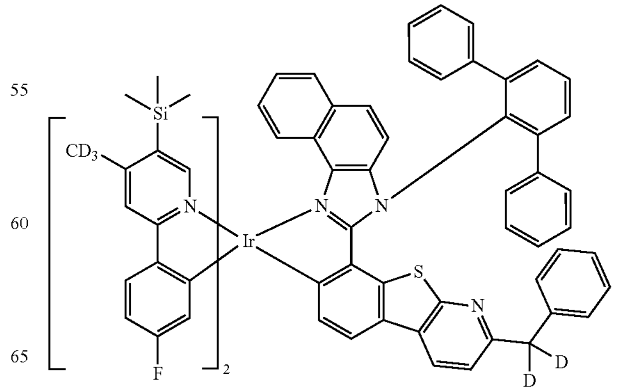

-continued
3960
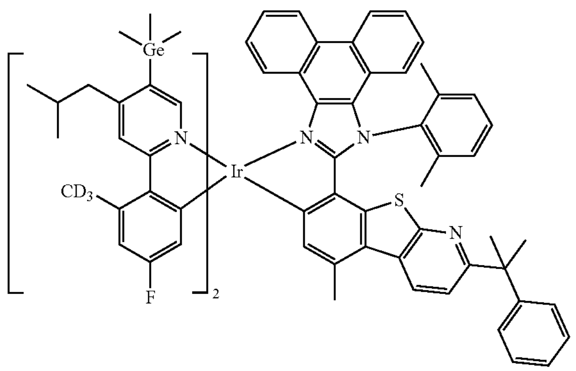
3961
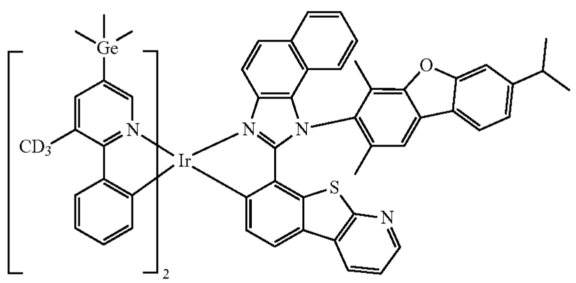
3962
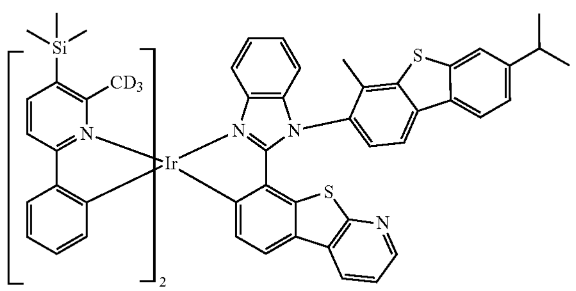
3963
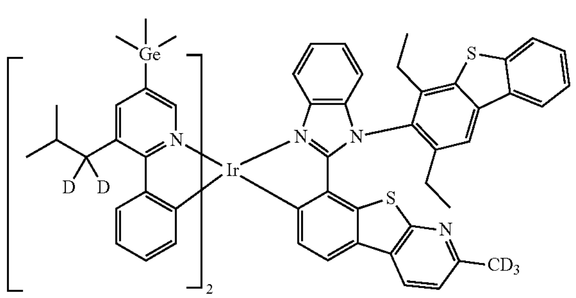
3964
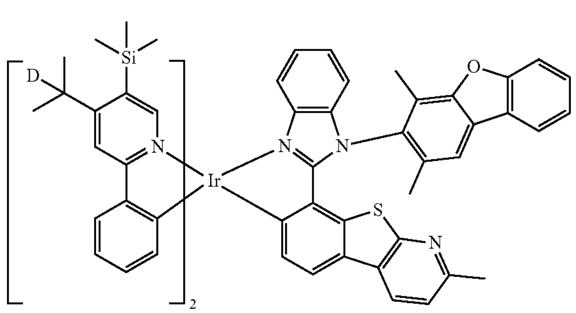
-continued
3965
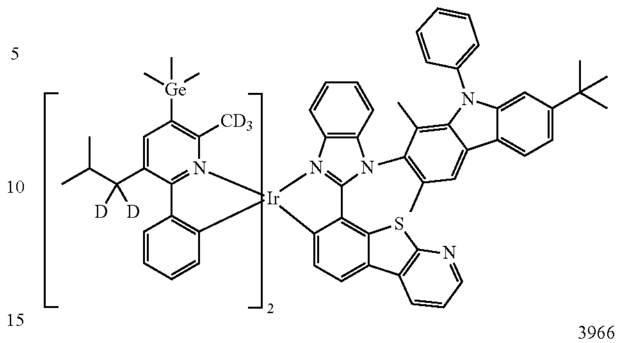
3966
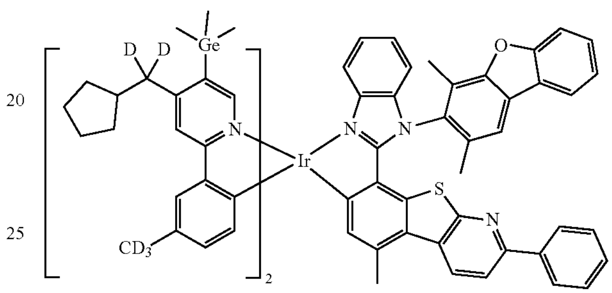
3967
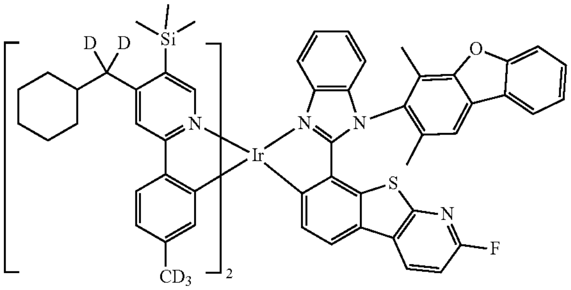
3968
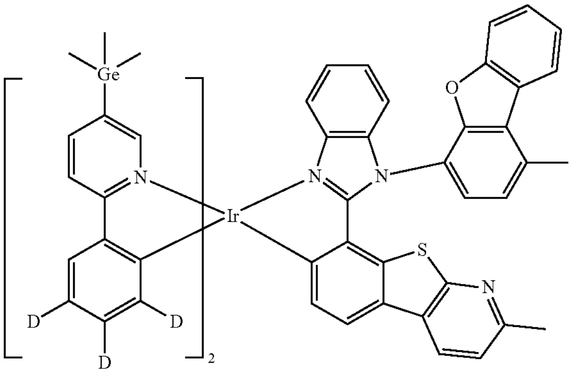

-continued
3969
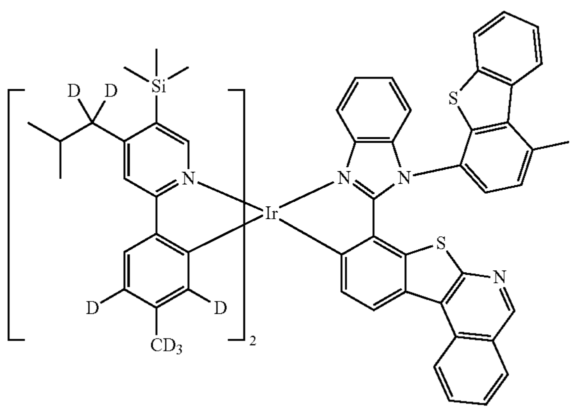
3970
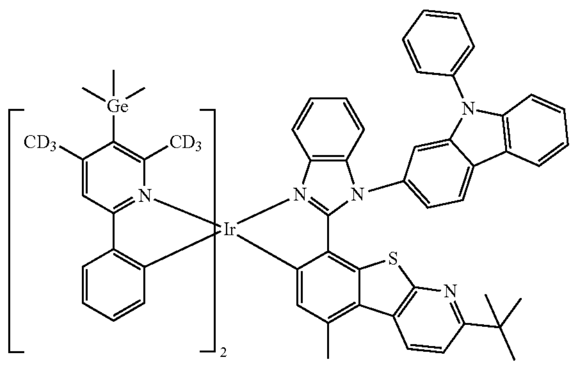
3971
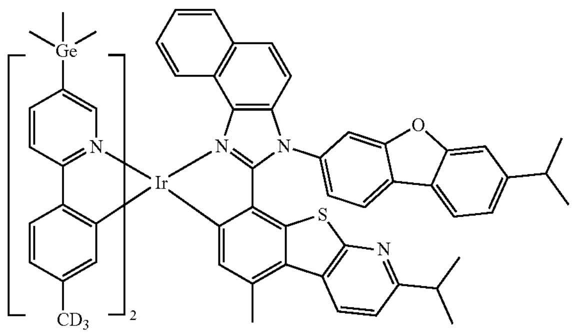
3972
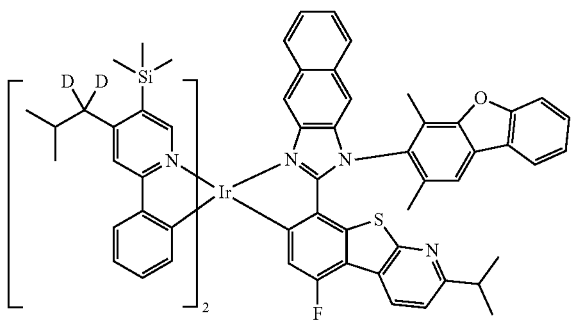
-continued
3973
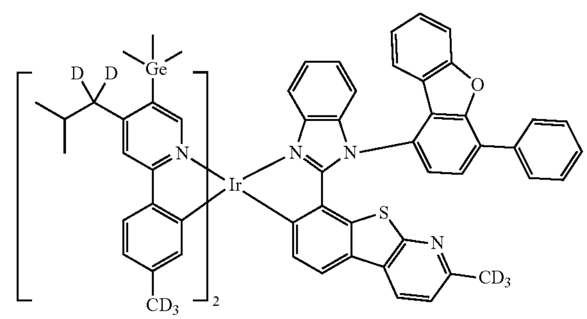
3974
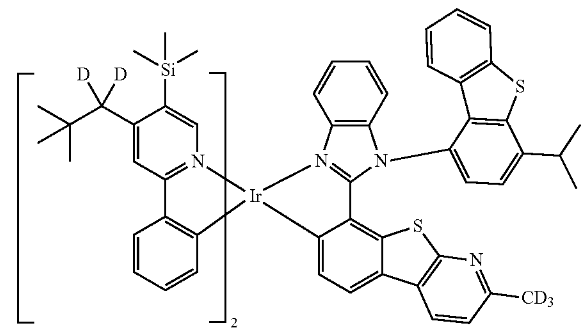
3975
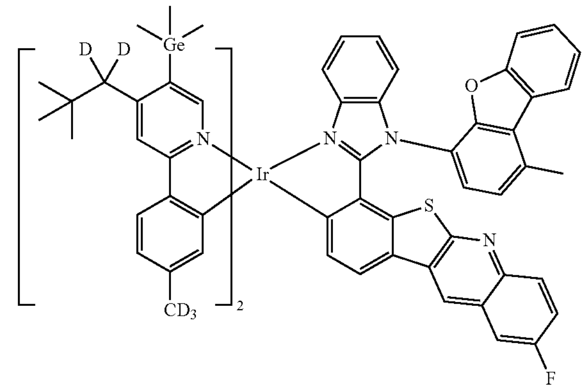
3976
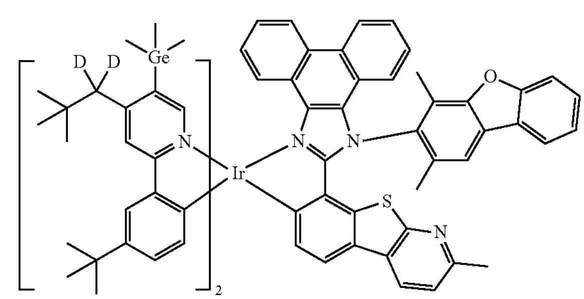

-continued
3977
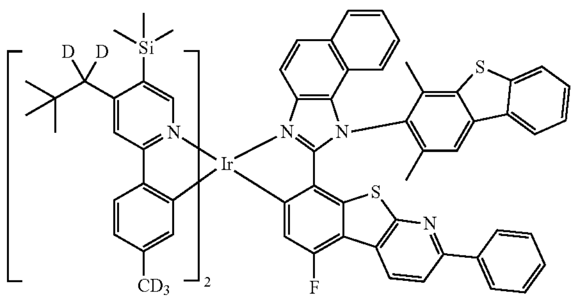
3978
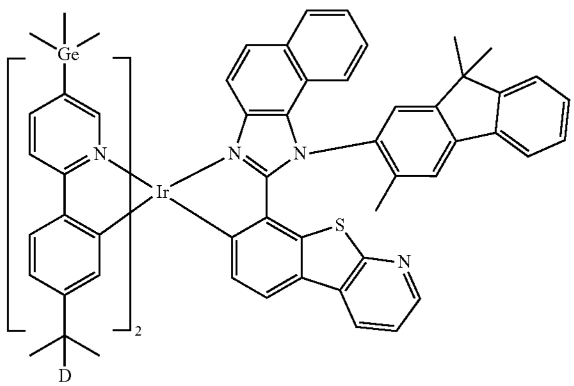
3979
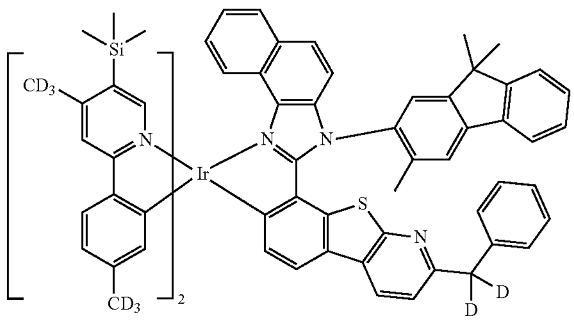
3980
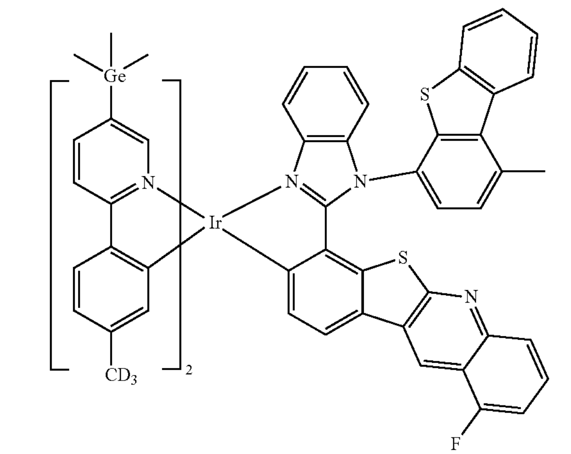
-continued
3981
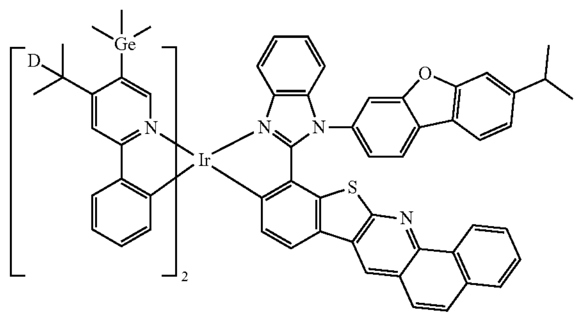
3982
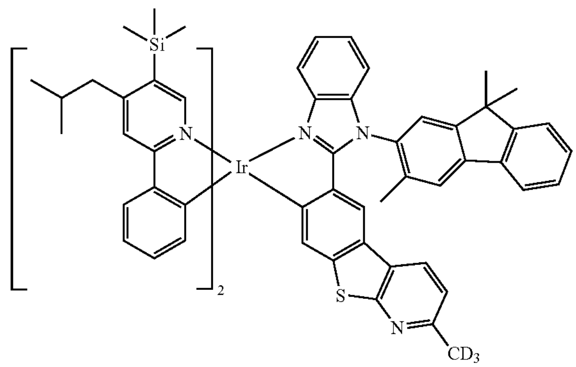
3983
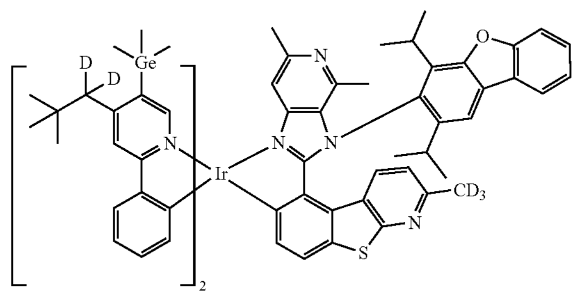
3984
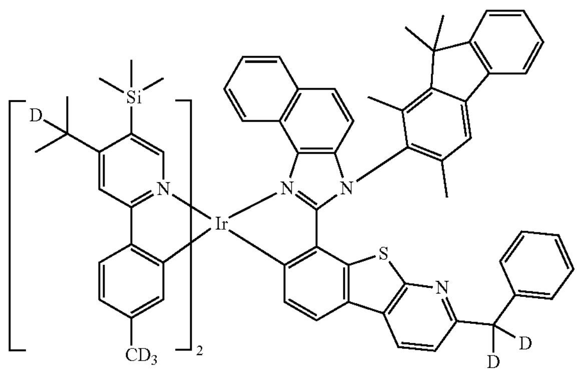

-continued
3985
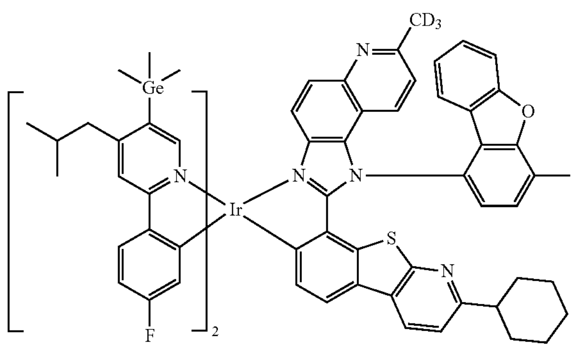
3986
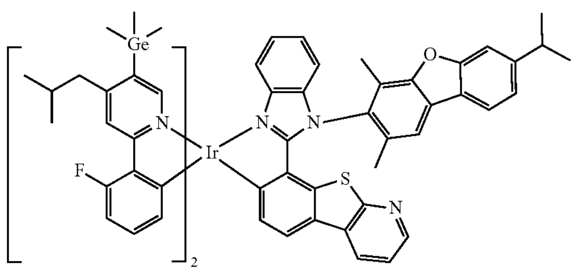
3987
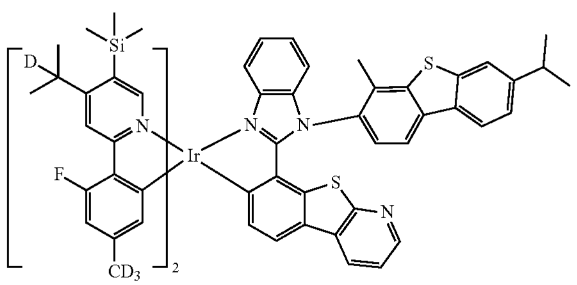
3988
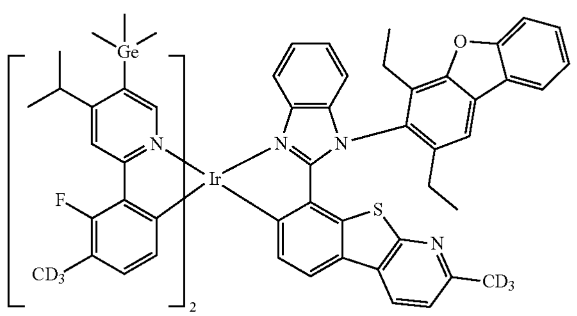
3989
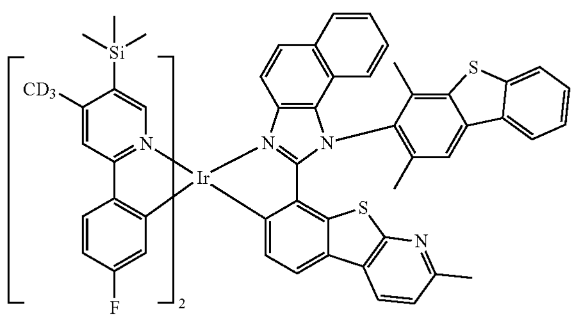
-continued
3990
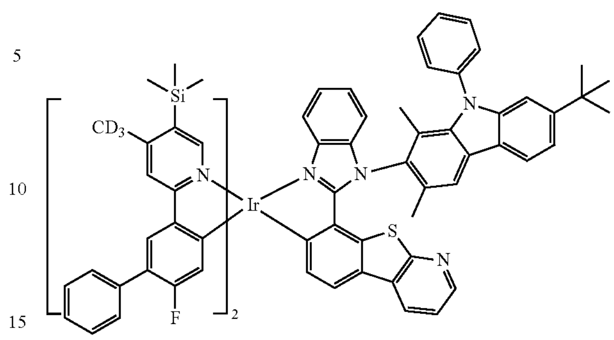
3991
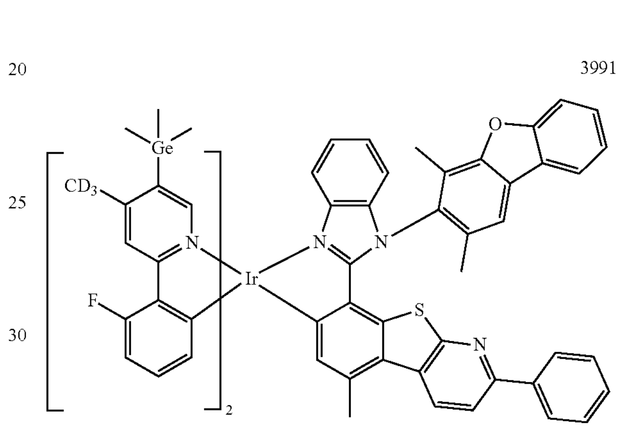
3992
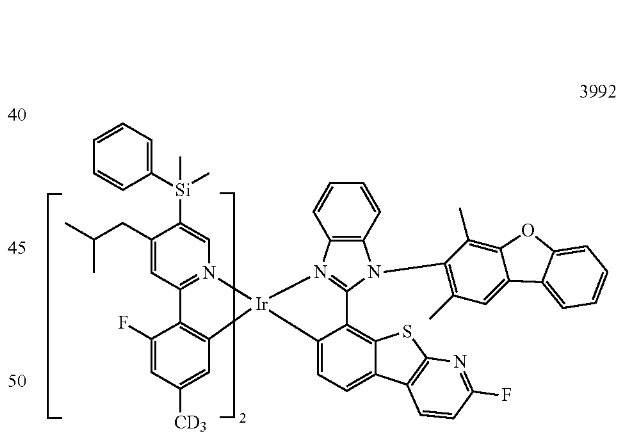
3993
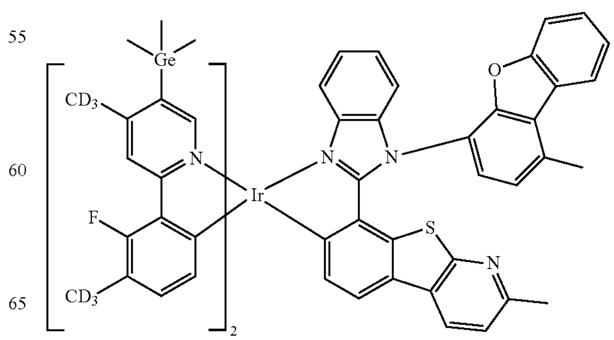

-continued
3994
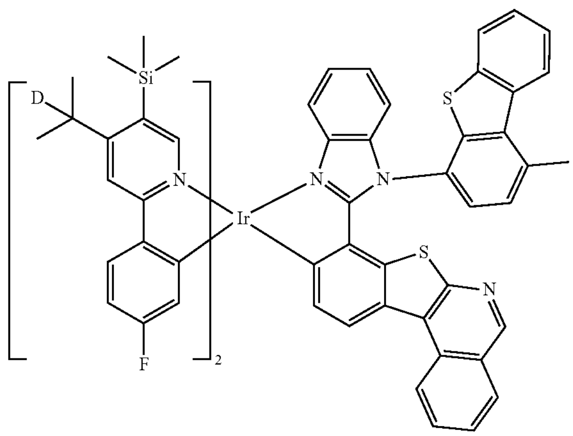
3995
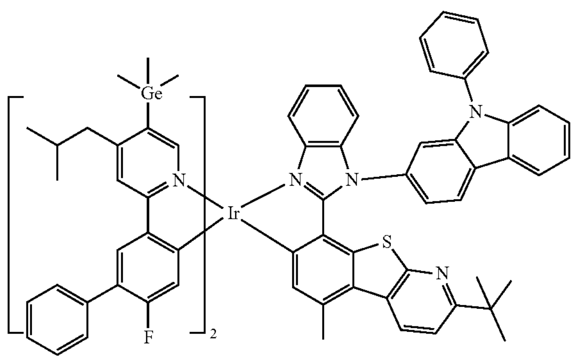
3996
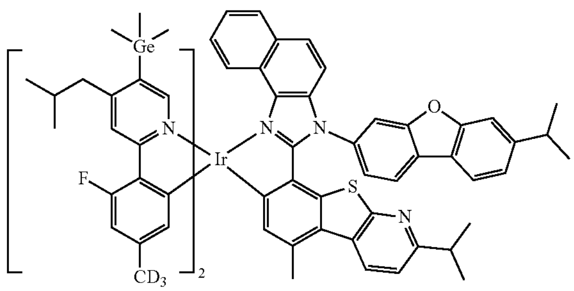
3997
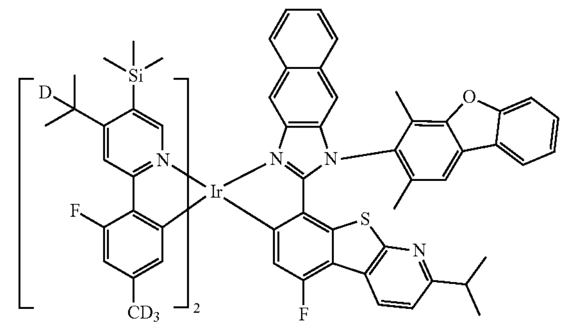
-continued
3998
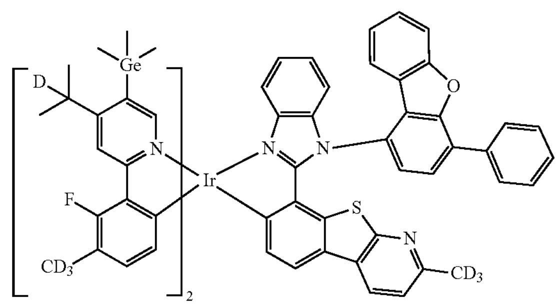
3999
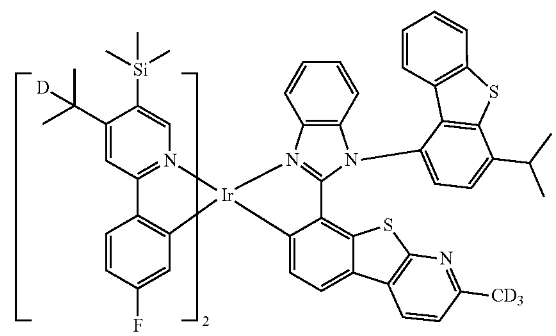
4000
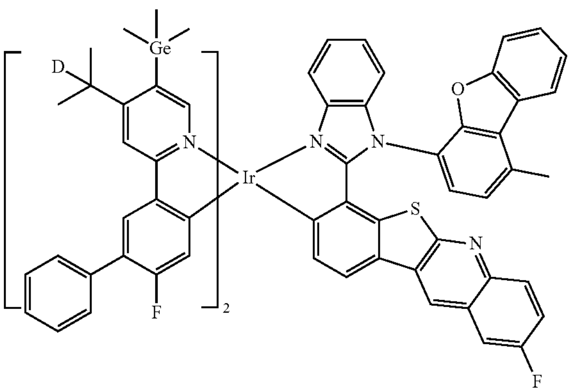
4001
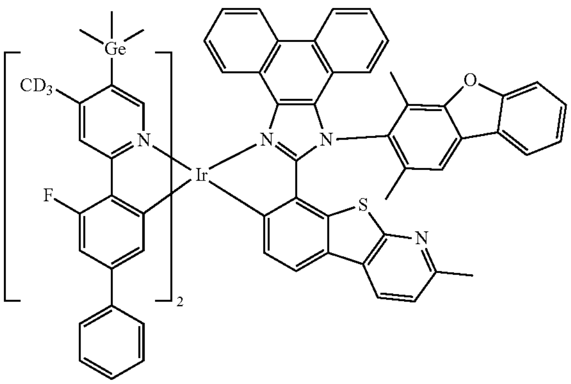

-continued
4002
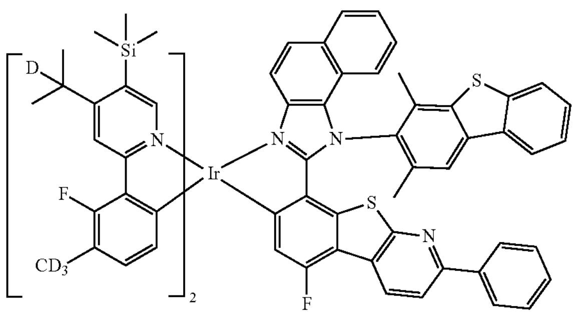
4003
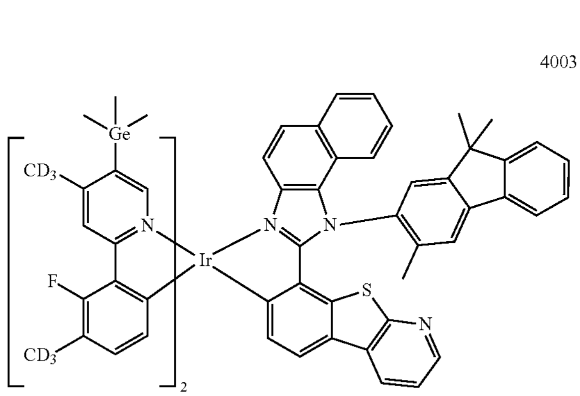
4004
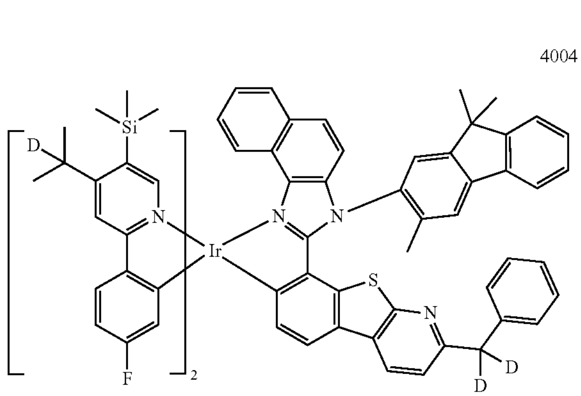
4005
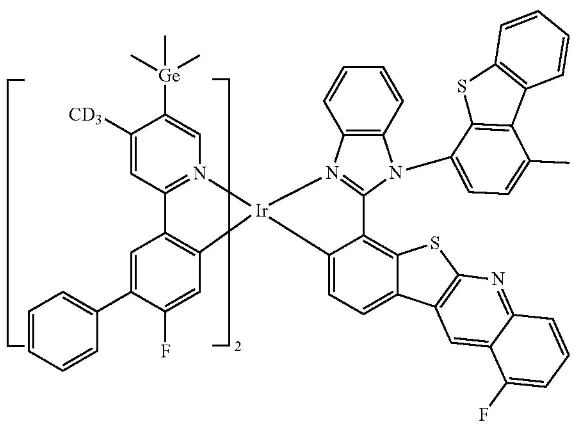
-continued
4006
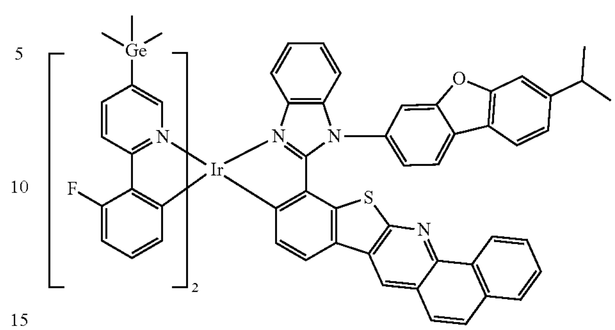
4007
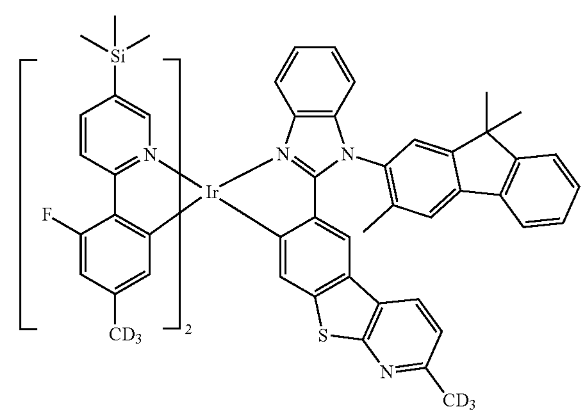
4008
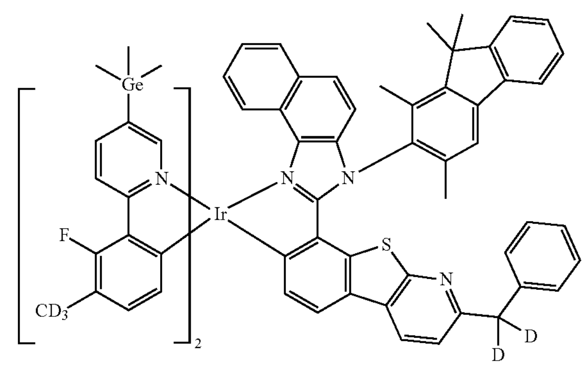
4009
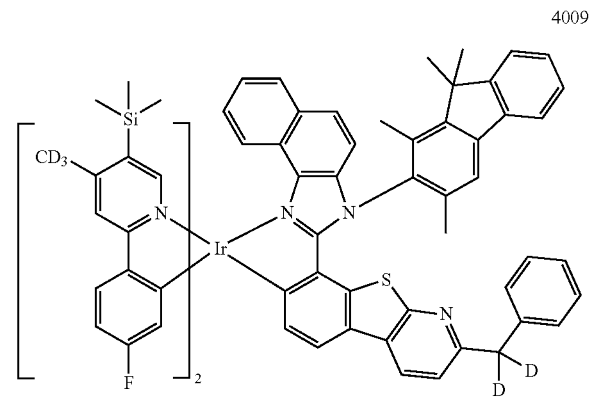

-continued
4010
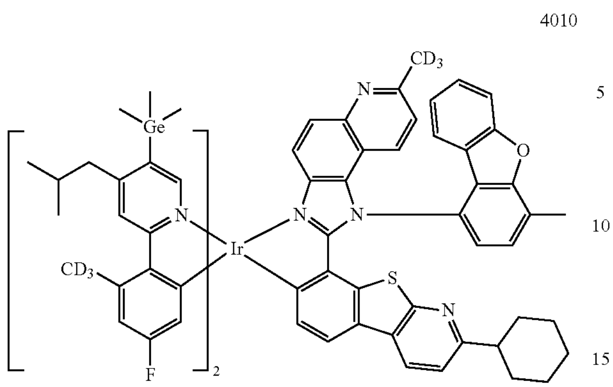
In one or more embodiments, the first hole-transporting compound and the second hole-transporting compound may each independently be at least one of Compounds H1-1 to H1-72 of Group 5-1 and Compounds H1-1 to H1-20 of Group 5-2:
Group 5-1
H1-1
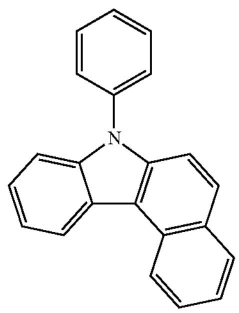
H1-2
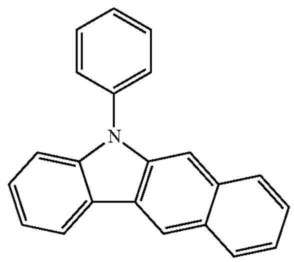
H1-3
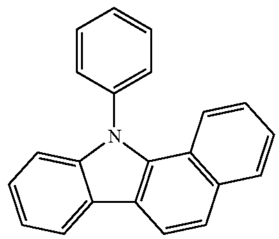
-continued
H1-4
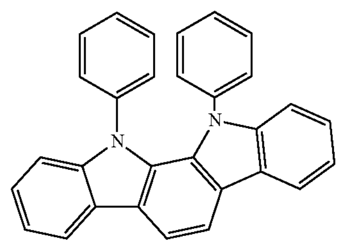
H1-5
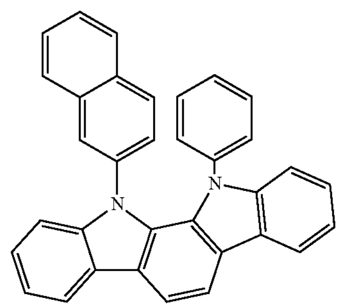
H1-6
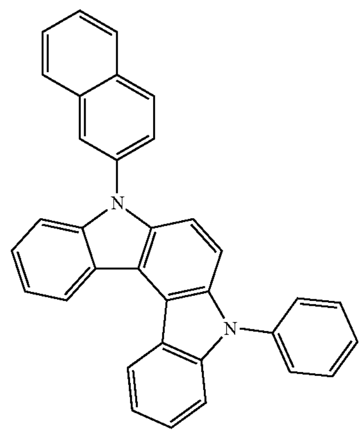
H1-7
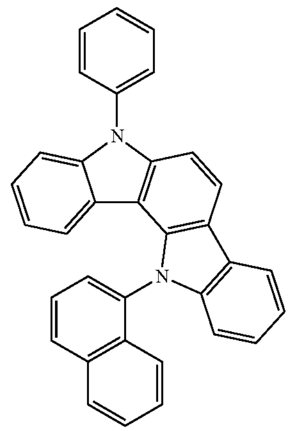

-continued
H1-8
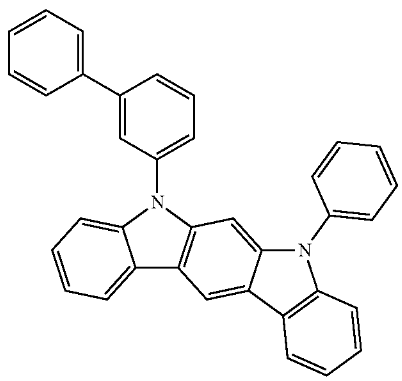
H1-9
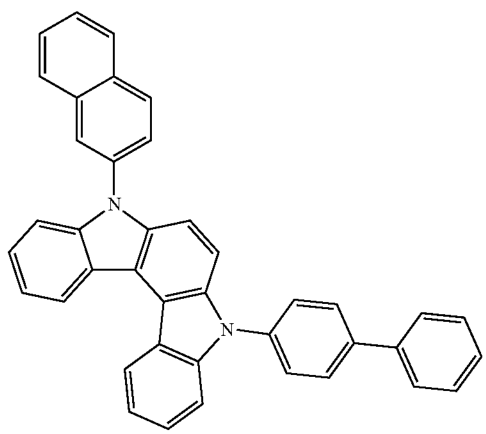
H1-10
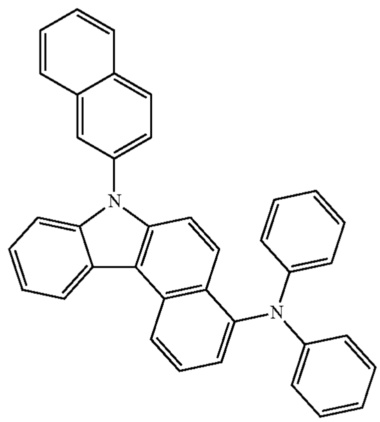
H1-11
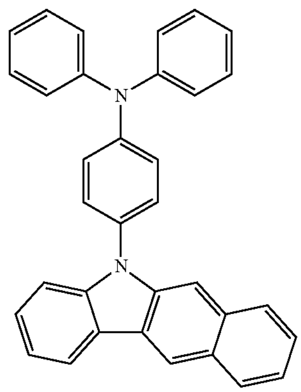
-continued
H1-12
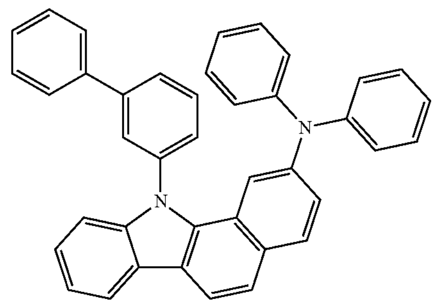
H1-13
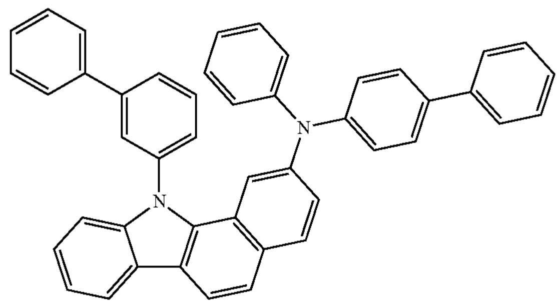
H1-14
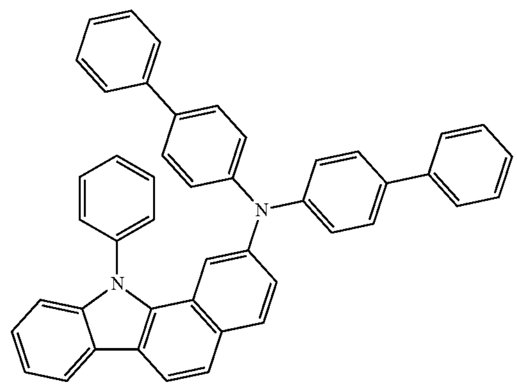
H1-15
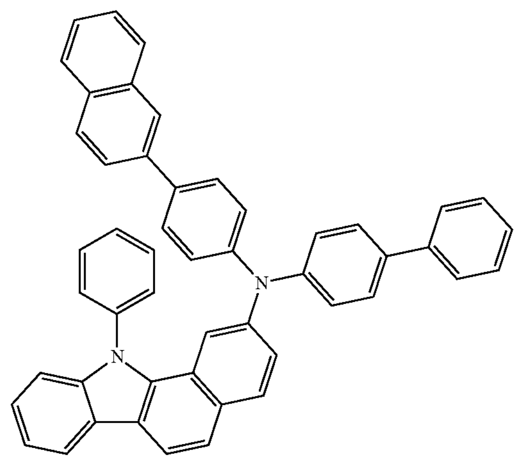

-continued
H1-16
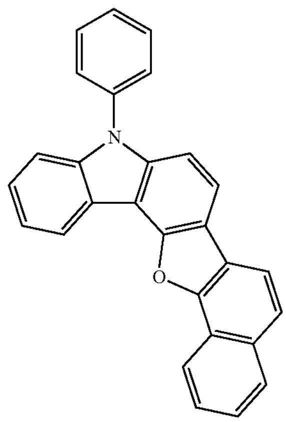
H1-17
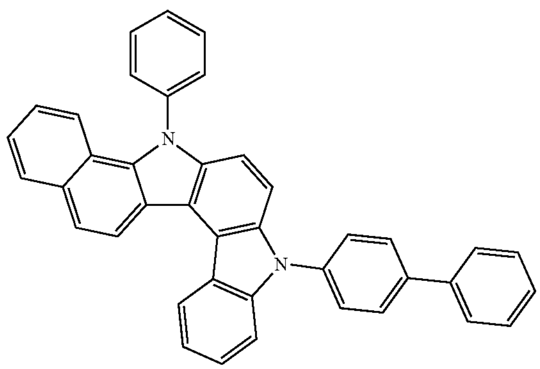
H1-18
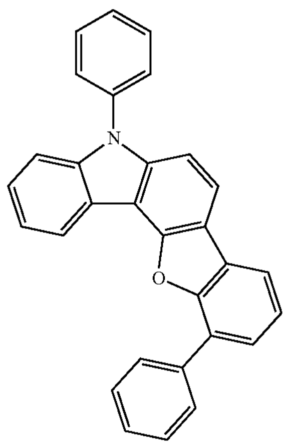
H1-19
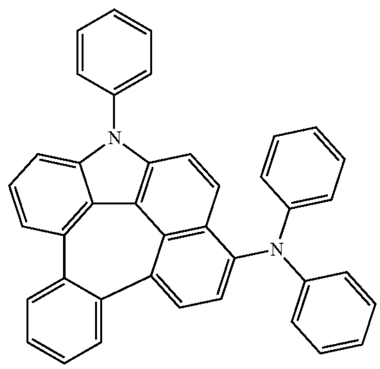
-continued
H1-20
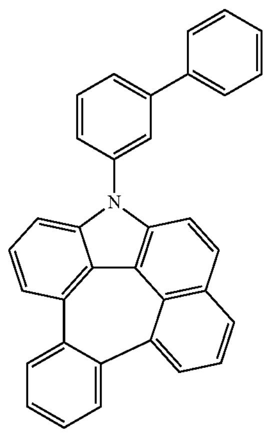
H1-21
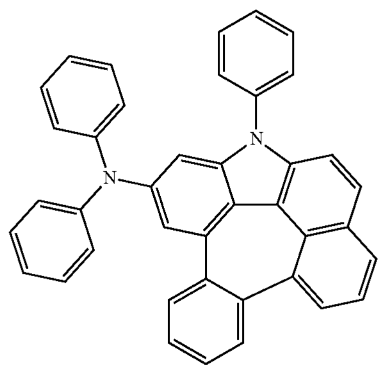
H1-22
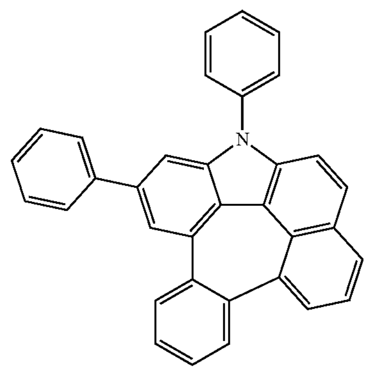
H1-23
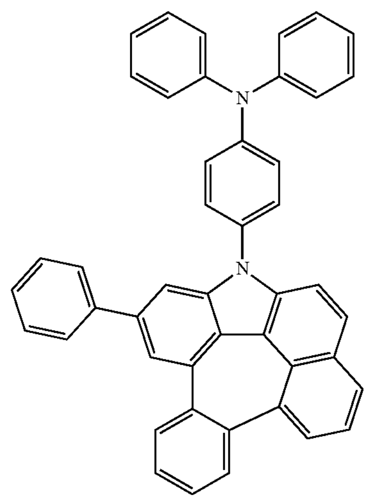

H1-24
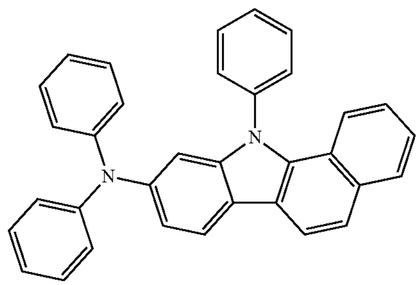
H1-25
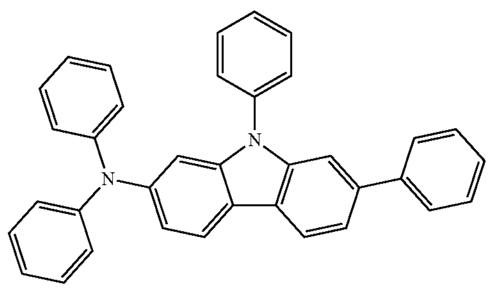
H1-26
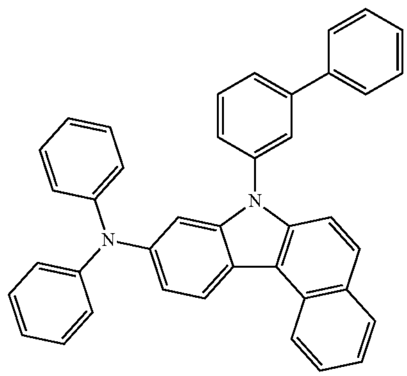
H1-27
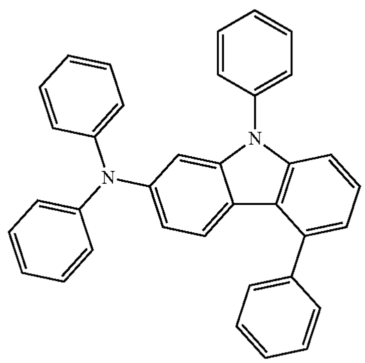
H1-28
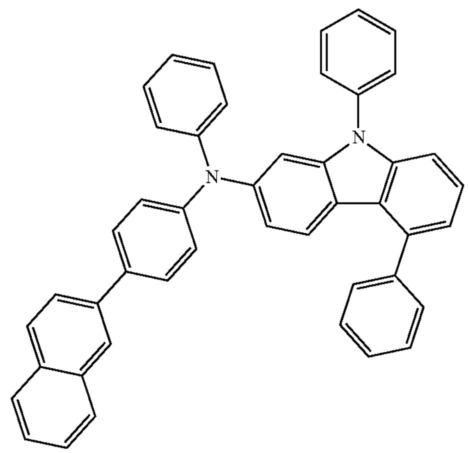
H1-29
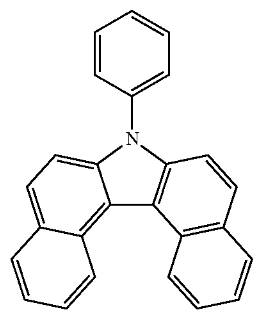
H1-30
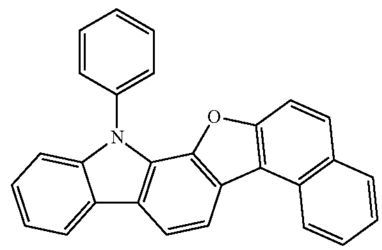
H1-31
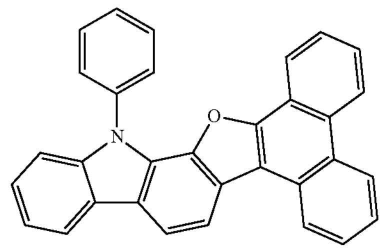

-continued
H1-32
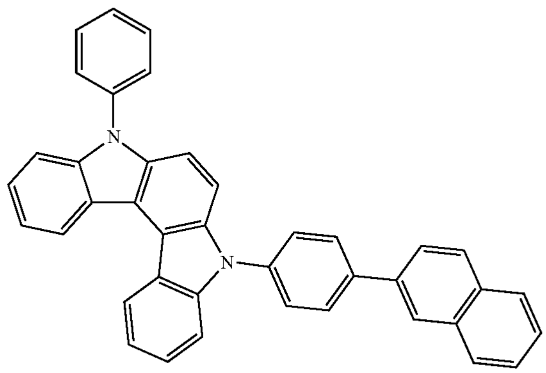
H1-33
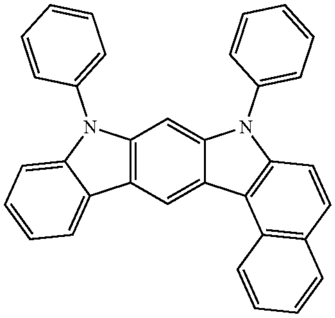
H1-34
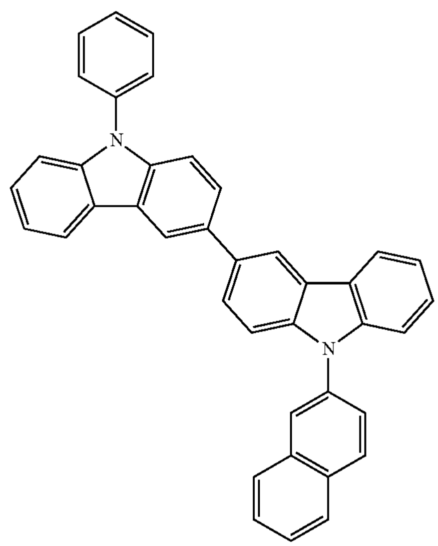
-continued
H1-35
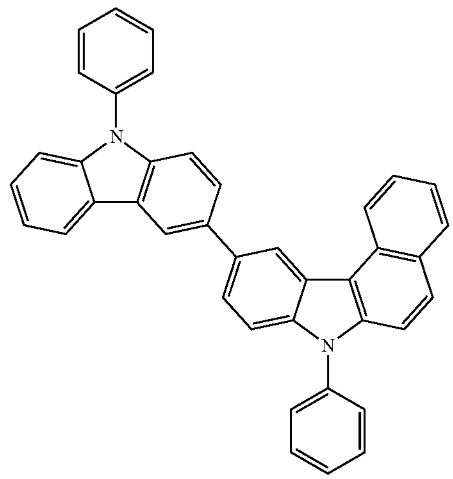
H1-36
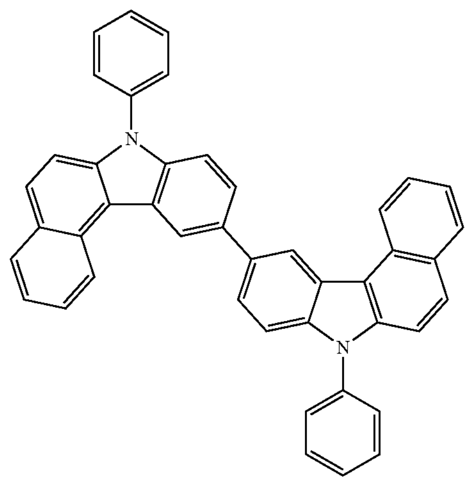
H1-37
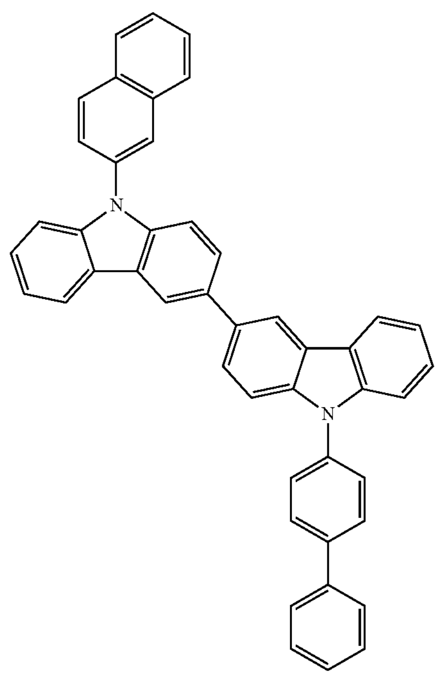

-continued
H1-38
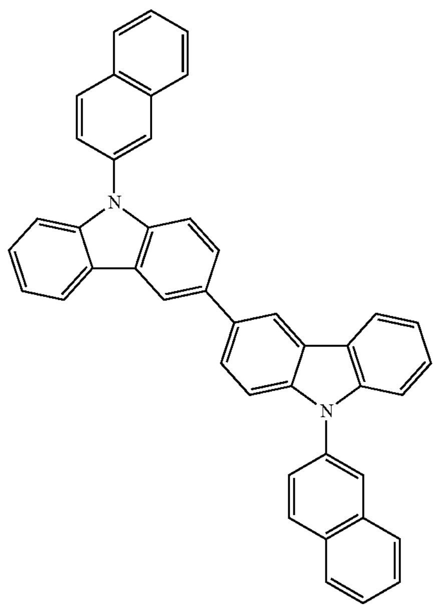
H1-39
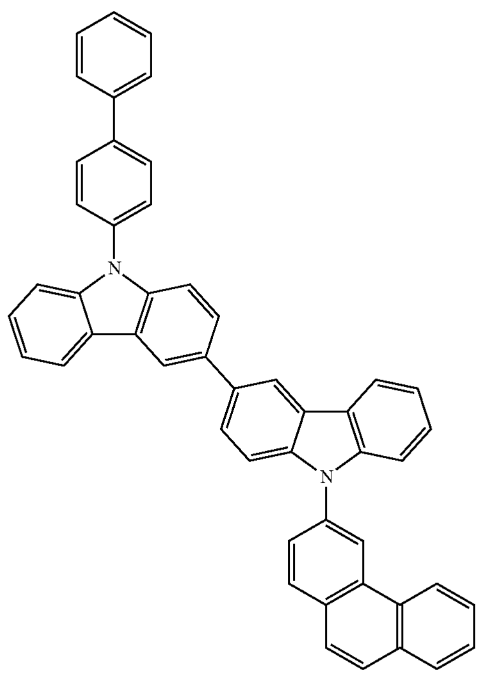
-continued
H1-40
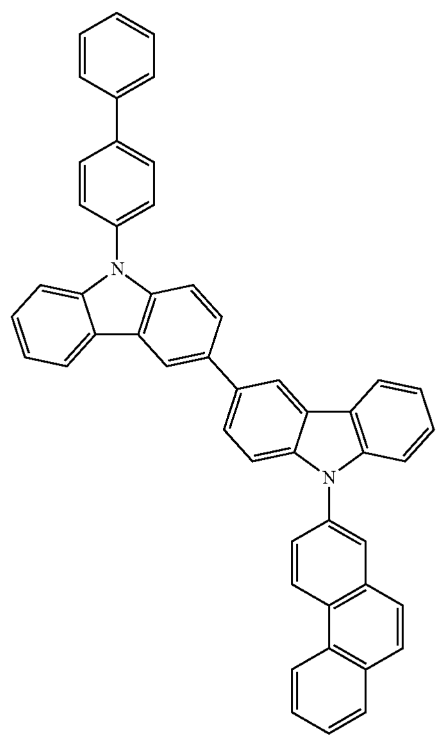
H1-41
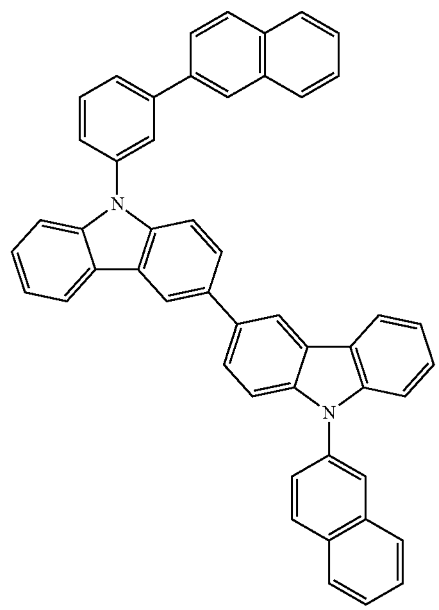

-continued
H1-42
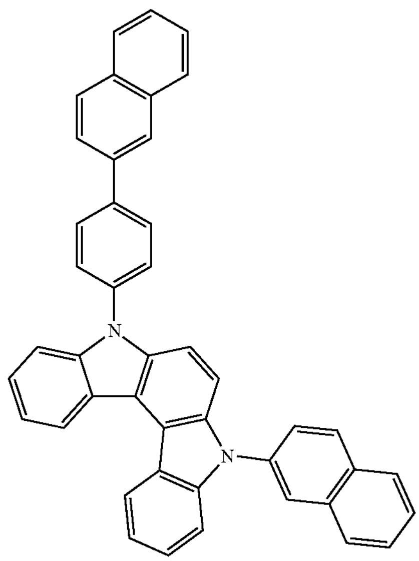
H1-43
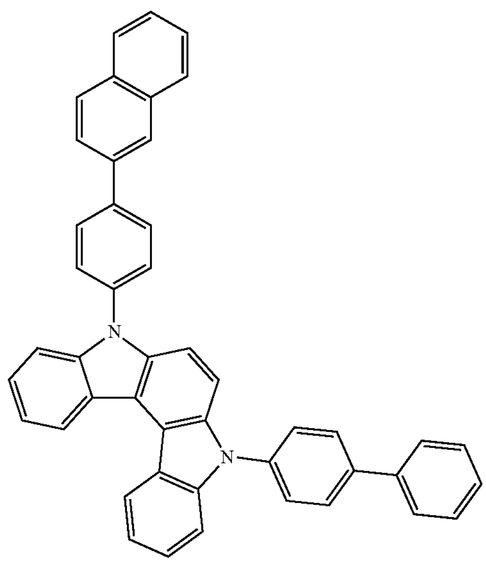
H1-44
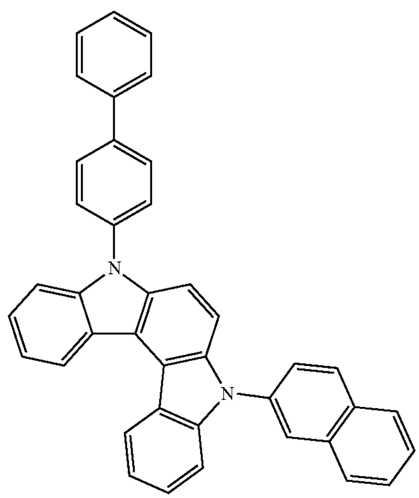
-continued
H1-45
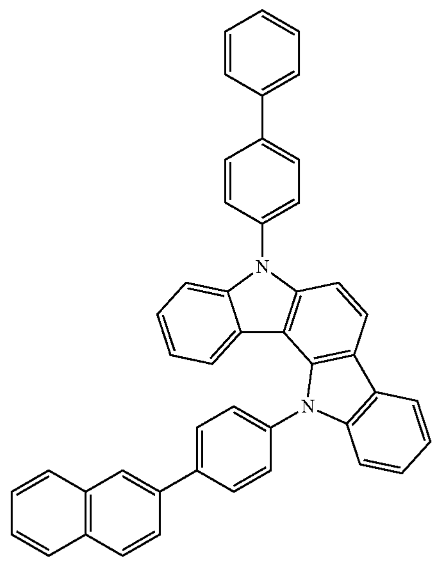
H1-46
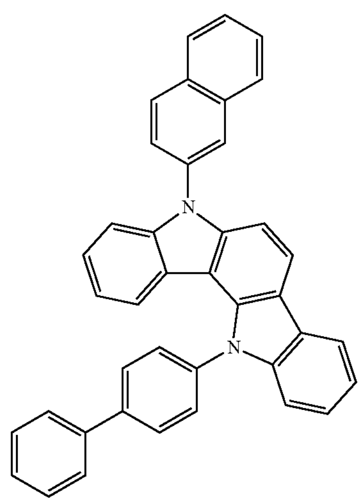
H1-47
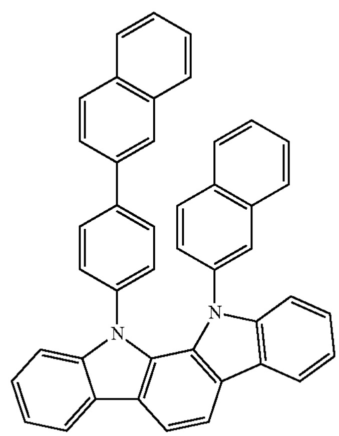

-continued
H1-48
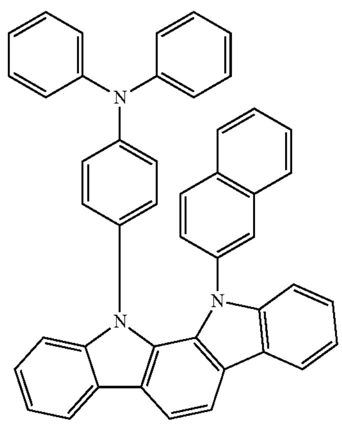
H1-49
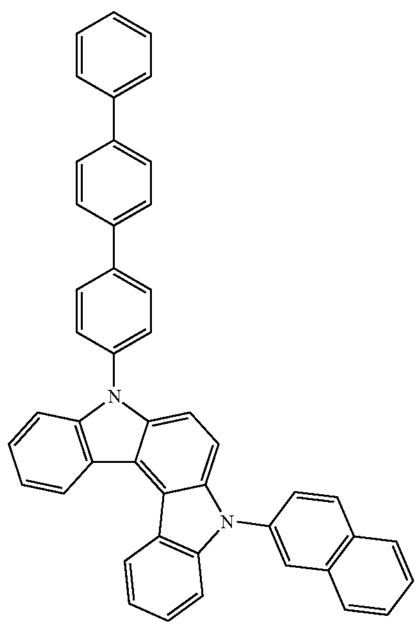
-continued
H1-50
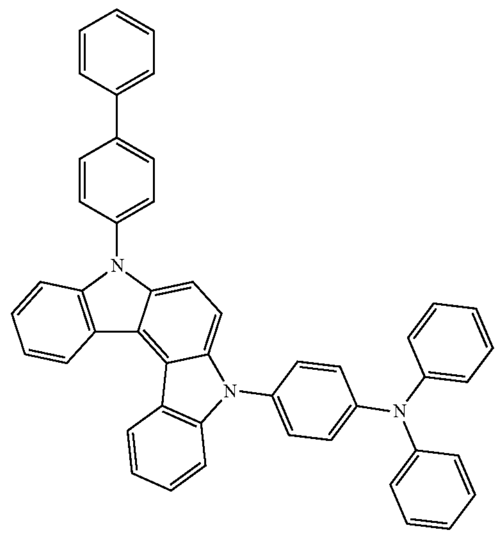
H1-51
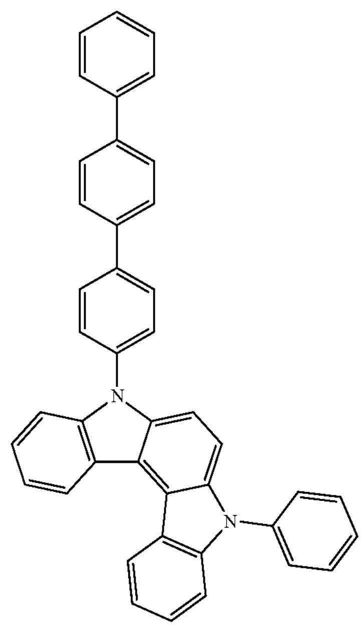
H1-52
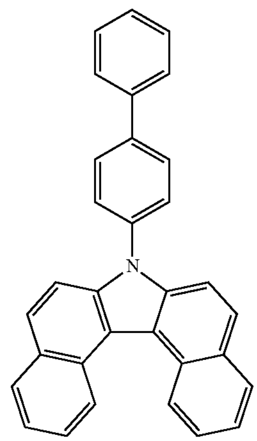

-continued
H1-53
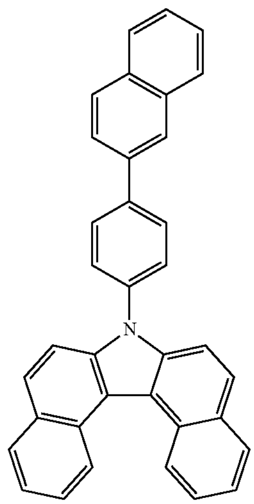
H1-54
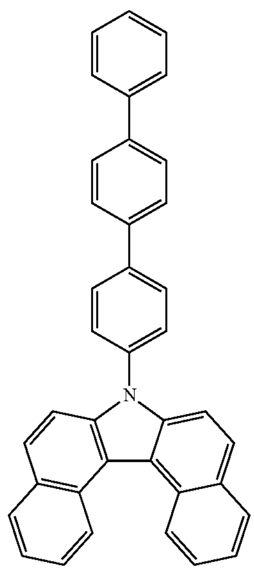
H1-55
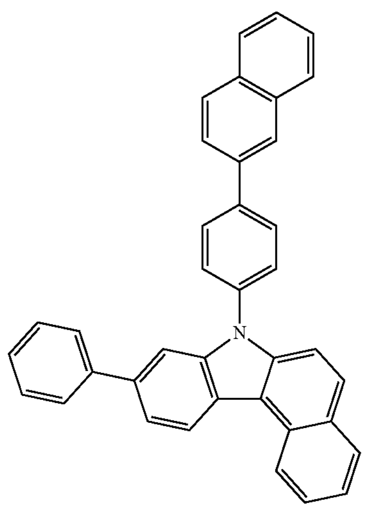
-continued
H1-56
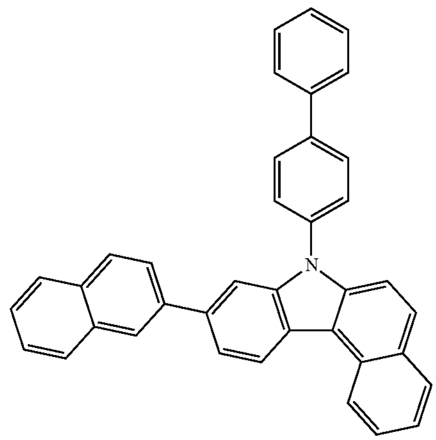
H1-57
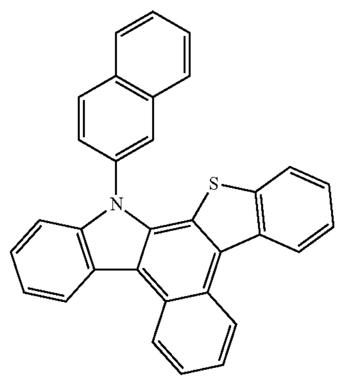
H1-58
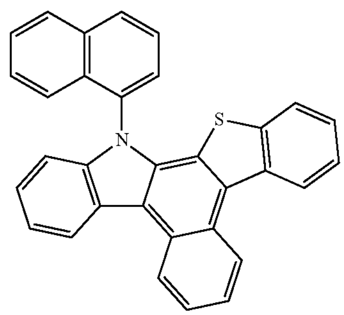
H1-59
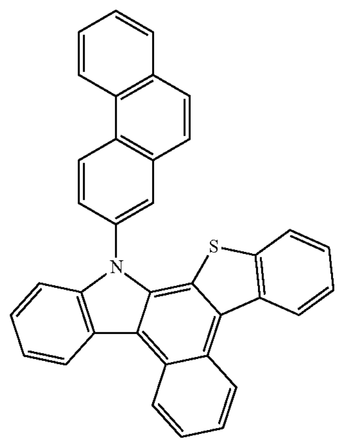

-continued
H1-60
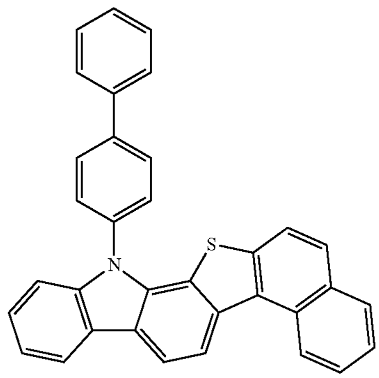
H1-61
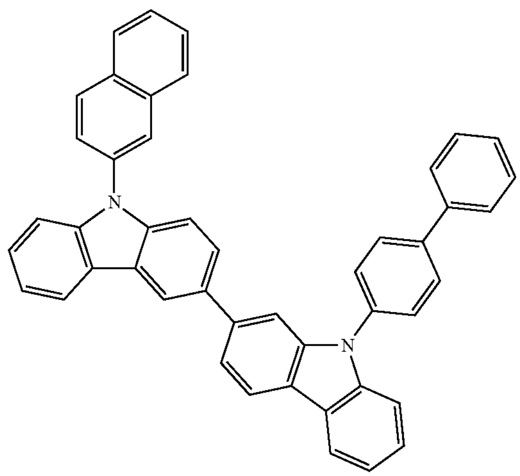
H1-62
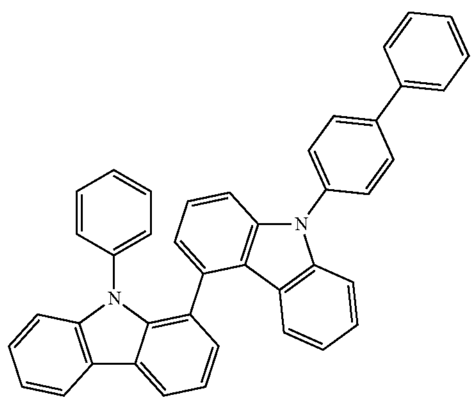
-continued
H1-63
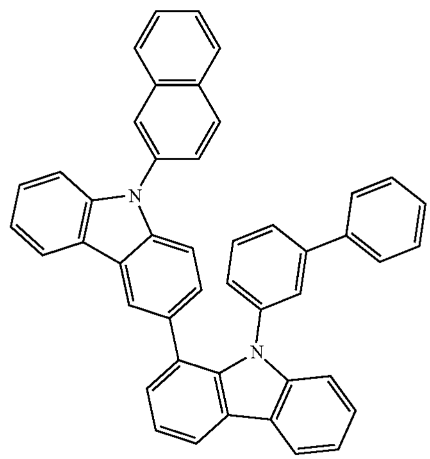
H1-64
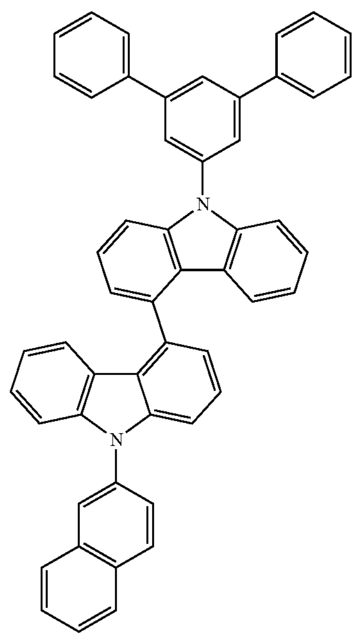
H1-65
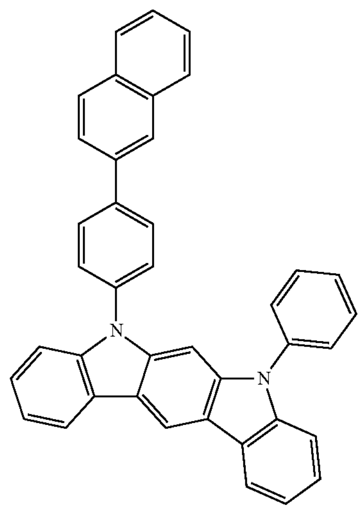

-continued
H1-66
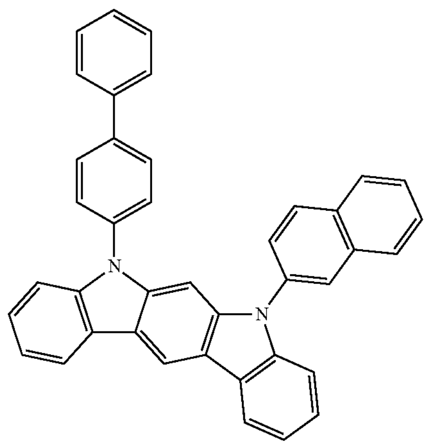
H1-67
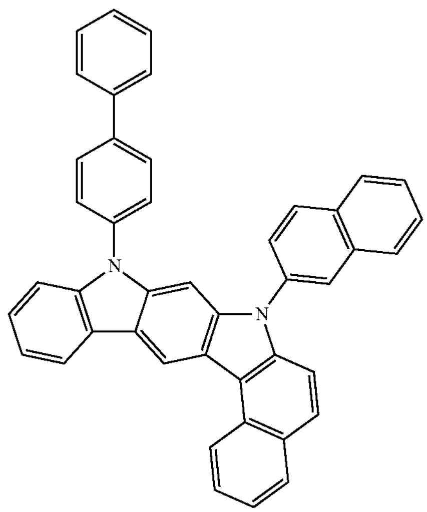
H1-68
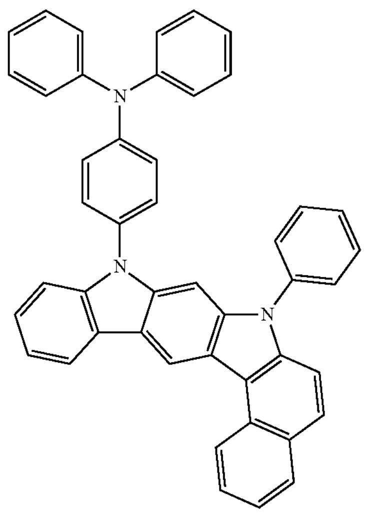
-continued
H1-69
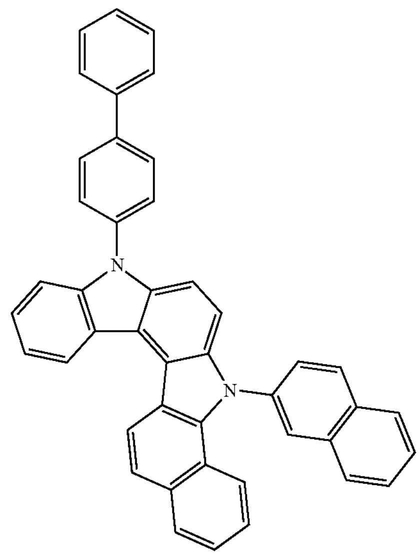
H1-70
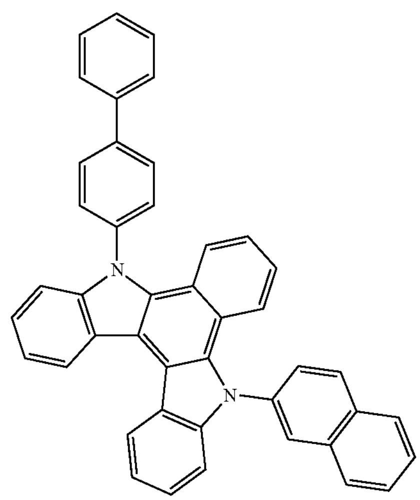
H1-71
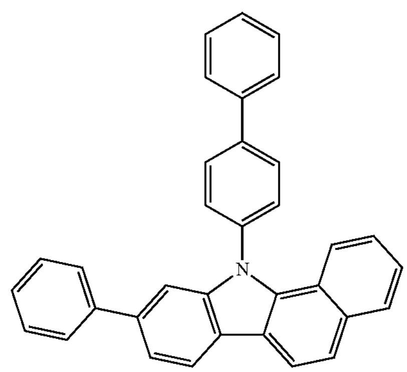

-continued
H1-72
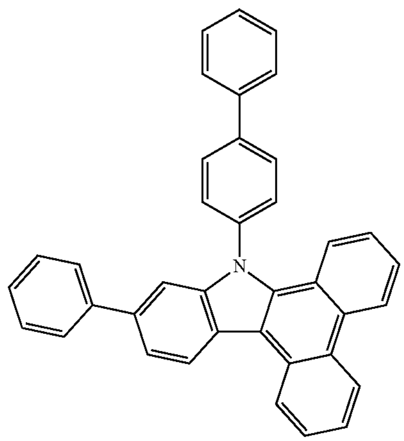
Group 5-2
H1-1
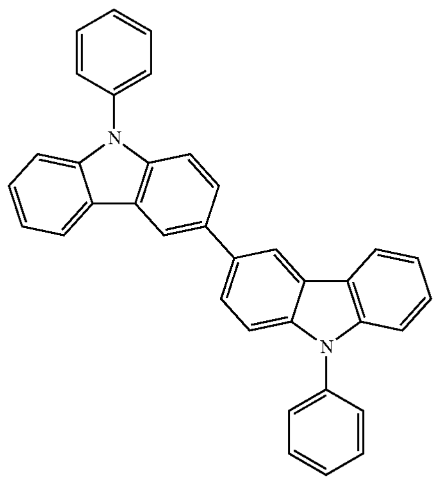
H1-2
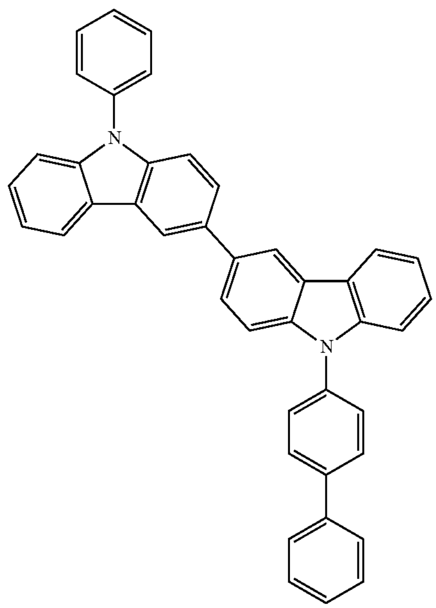
-continued
H1-3
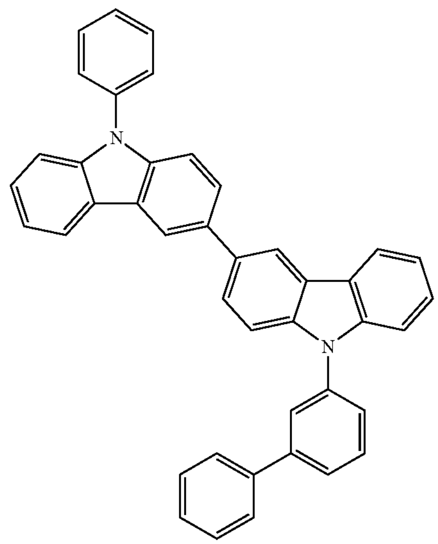
H1-4
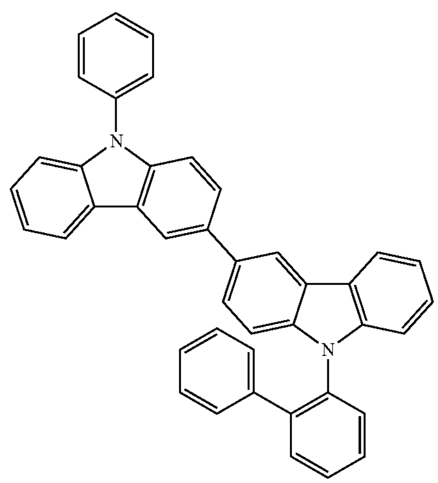
H1-5
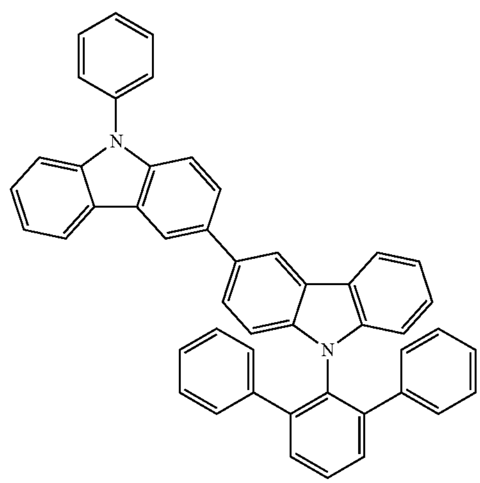

-continued
H1-6
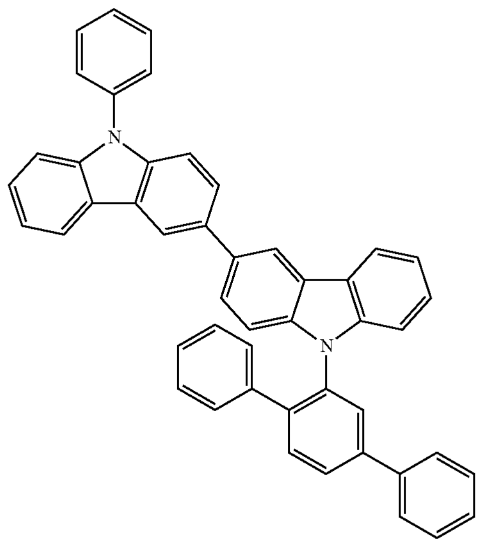
H1-7
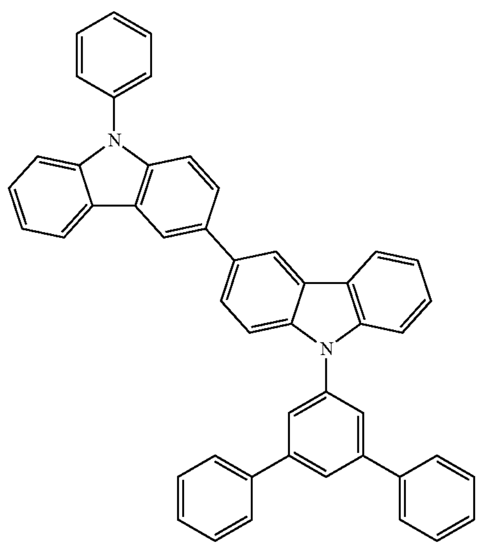
-continued
H1-8
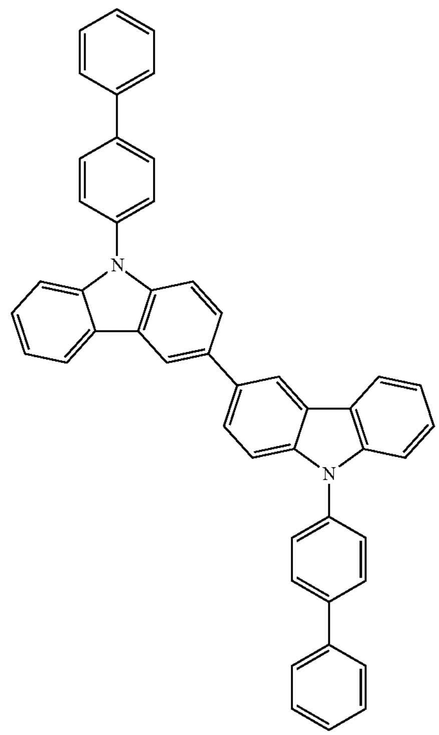
H1-9
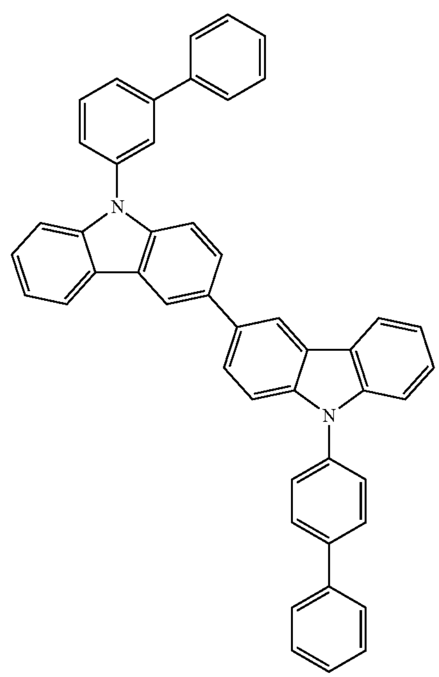

-continued
H1-10
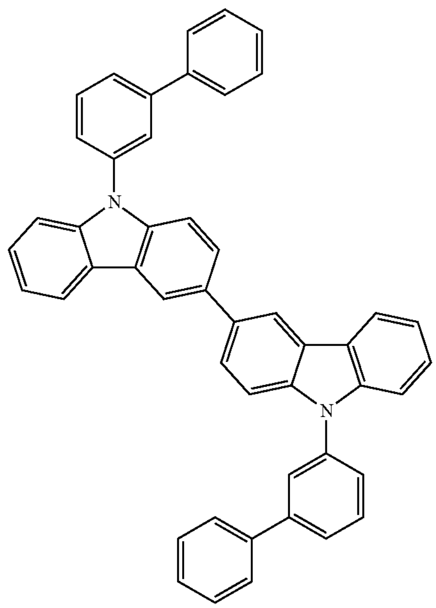
H1-11
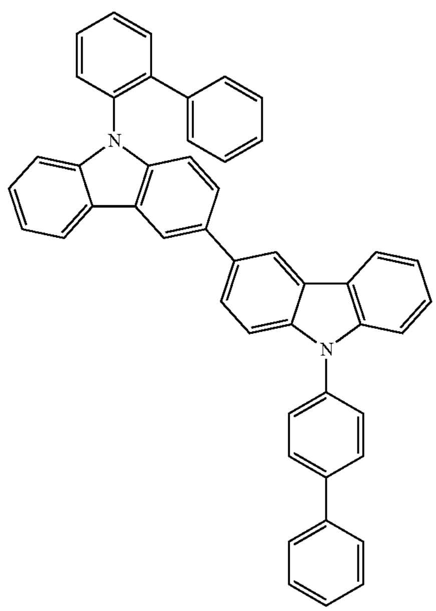
H1-12
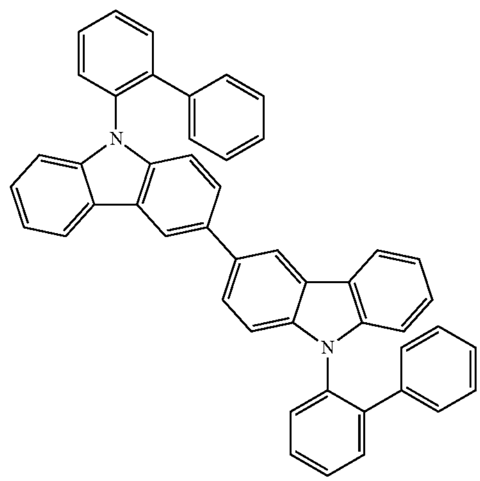
H1-13
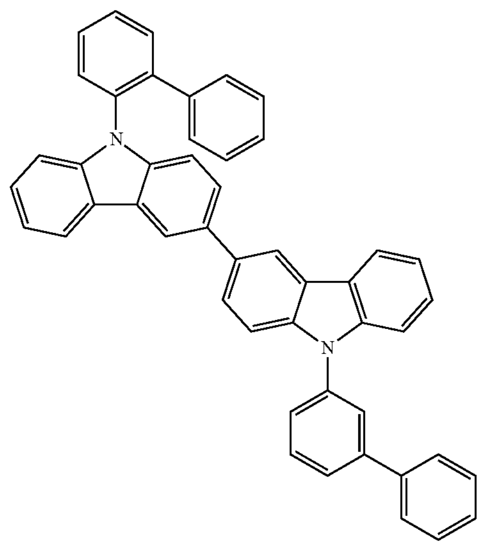
H1-14
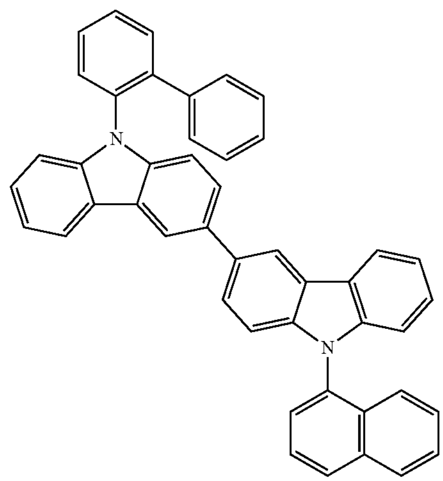

-continued
H1-15
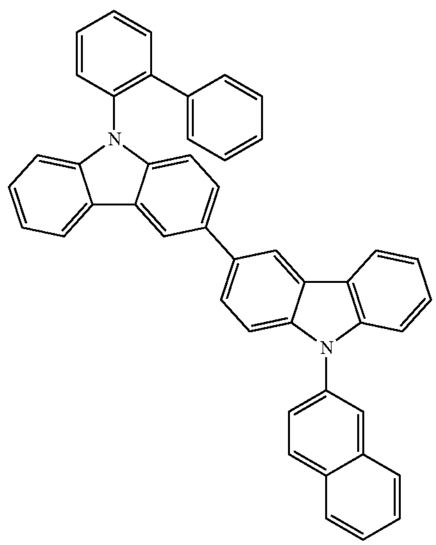
H1-16
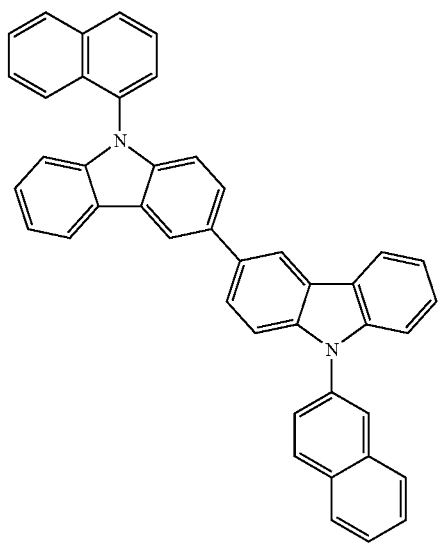
H1-17
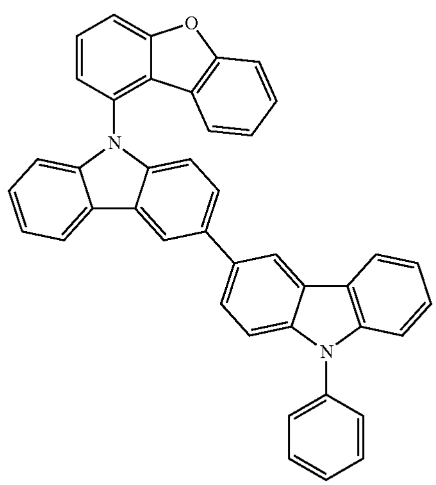
-continued
H1-18
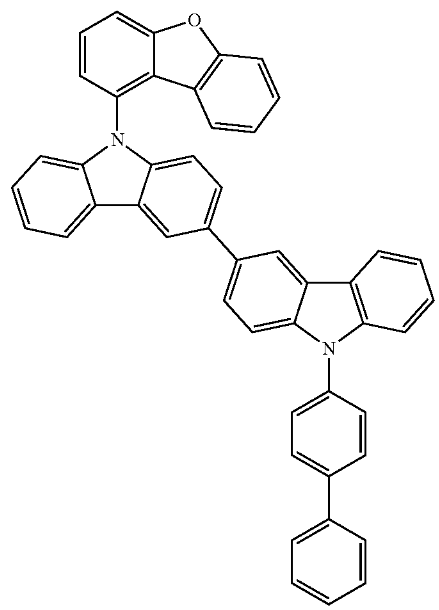
H1-19
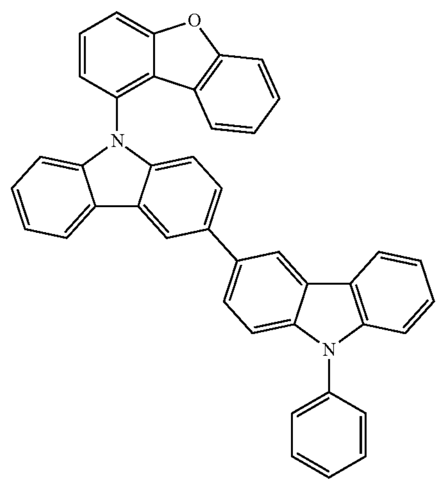

-continued
H1-20
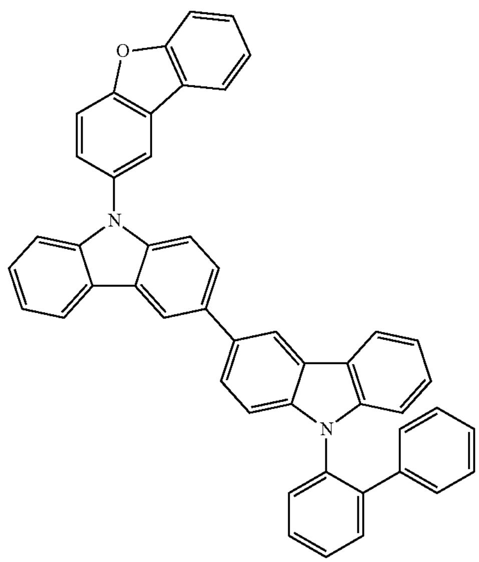
In one or more embodiments, the first electron-transporting compound and the second electron-transporting compound may each be at least one of Compounds E1-1 to E1-63:
E1-1
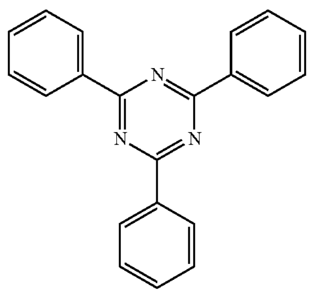
E1-2
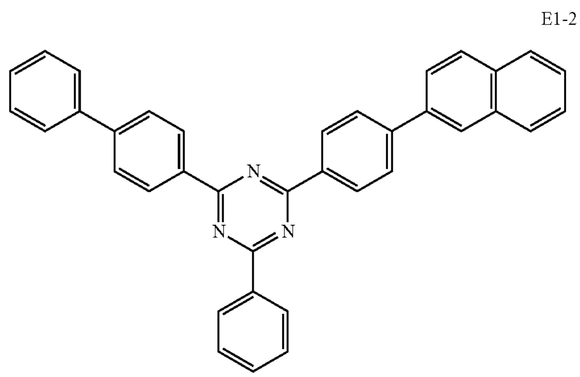
-continued
E1-3
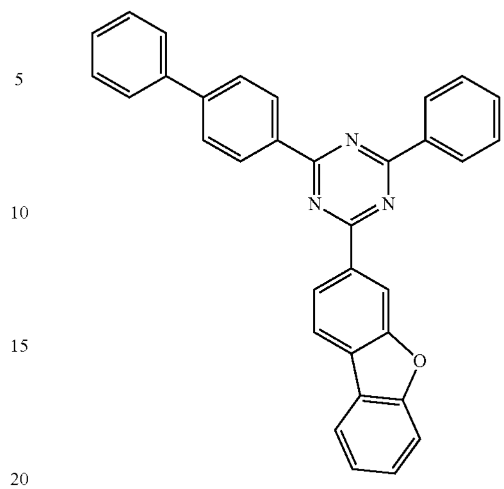
E1-4
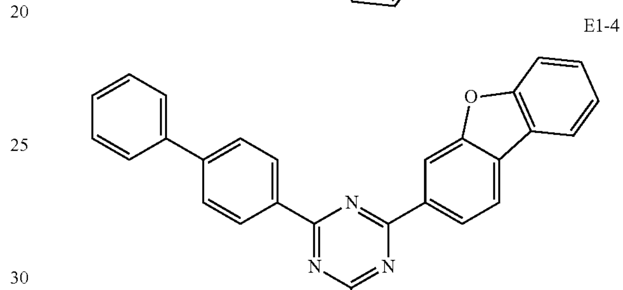
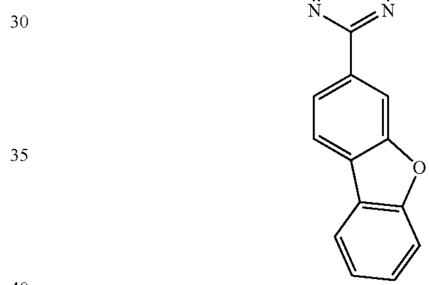
E1-5
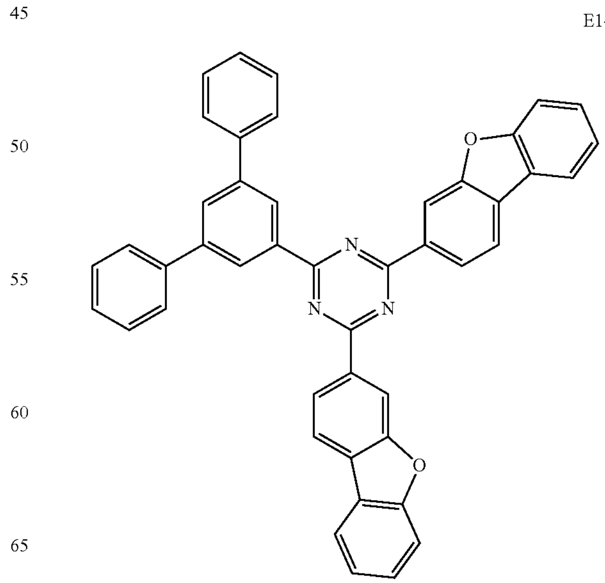

-continued
E1-6
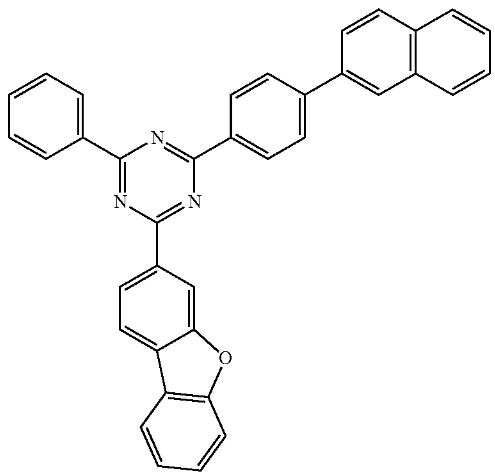
E1-7
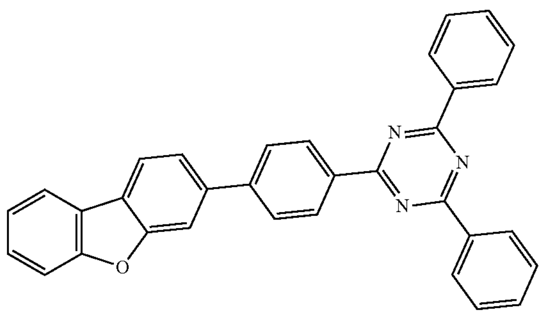
E1-8
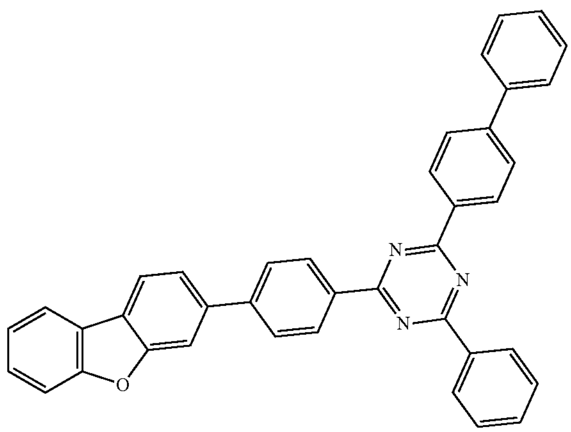
E1-9
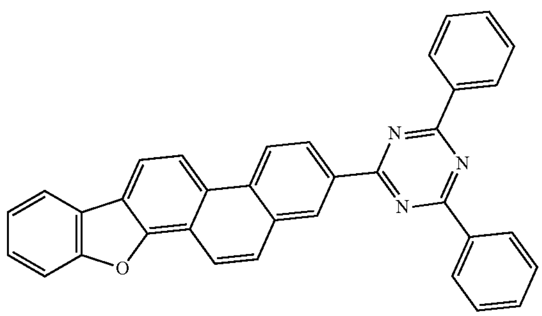
-continued
E1-10
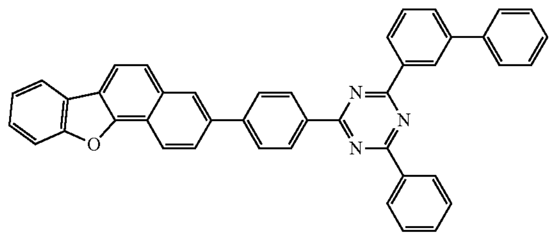
E1-11
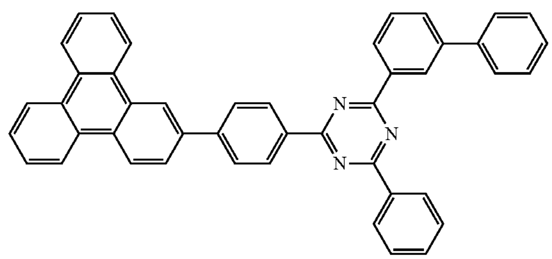
E1-12
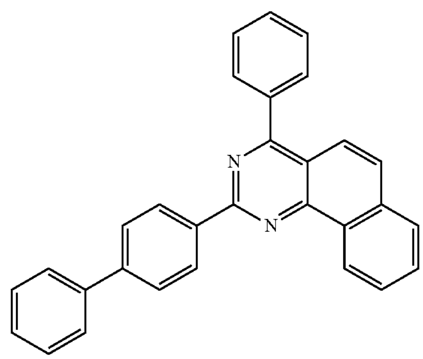
E1-13
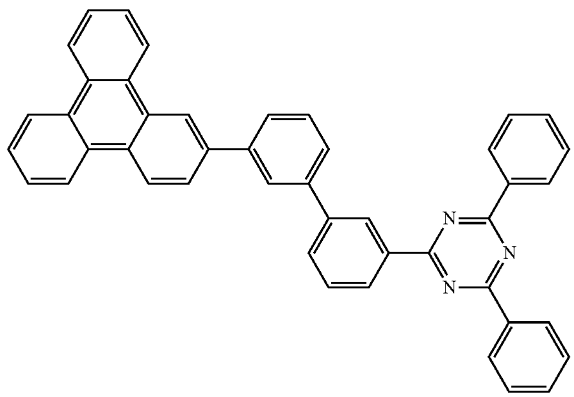

-continued
E1-14
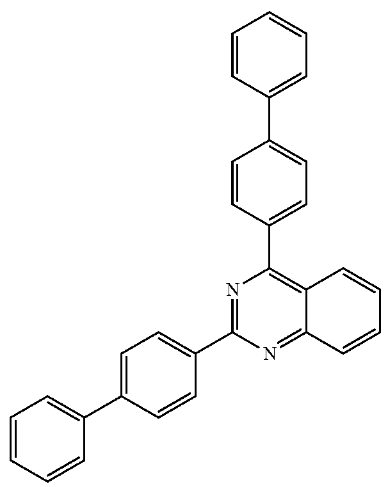
E1-15
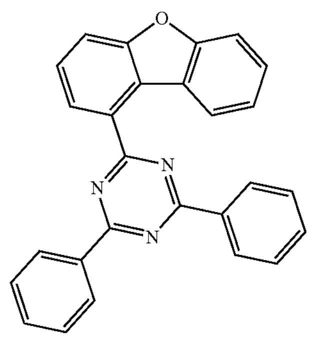
E1-16
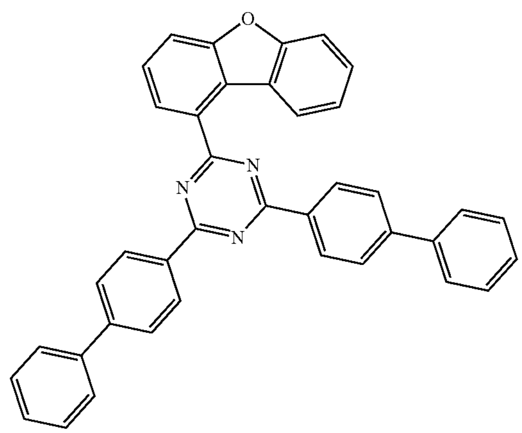
E1-17
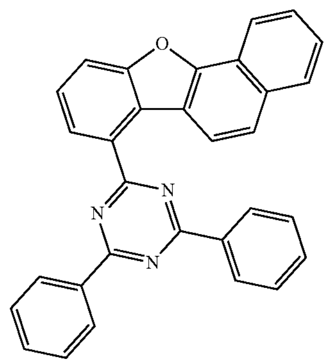
-continued
E1-18
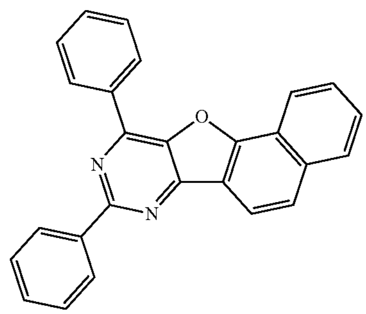
E1-19
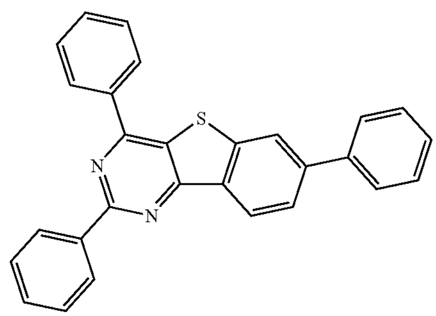
E1-20
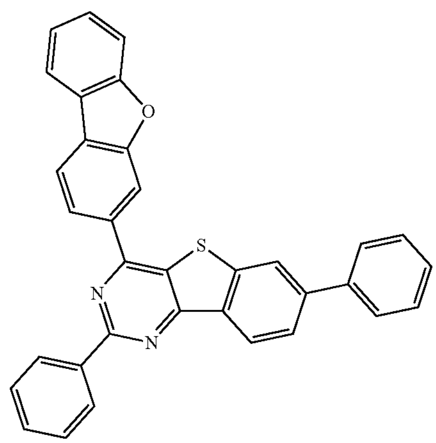
E1-21
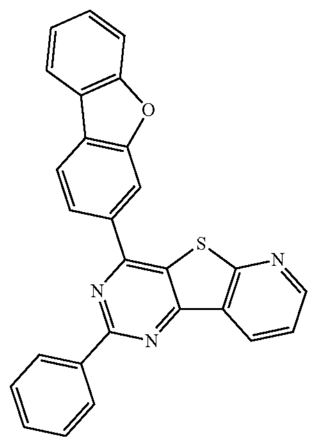

-continued
E1-22
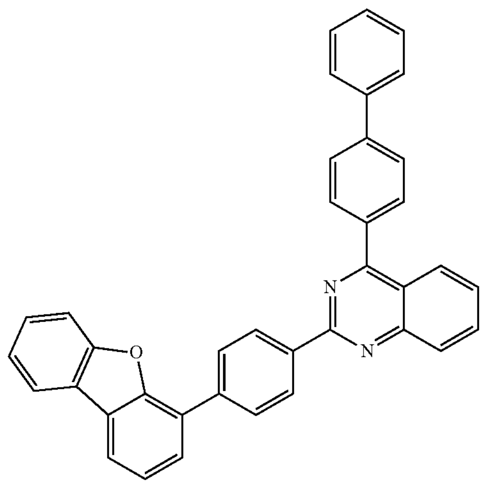
E1-23
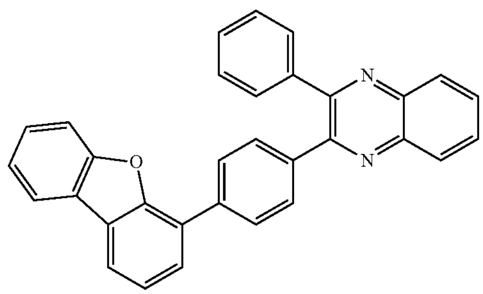
E1-24
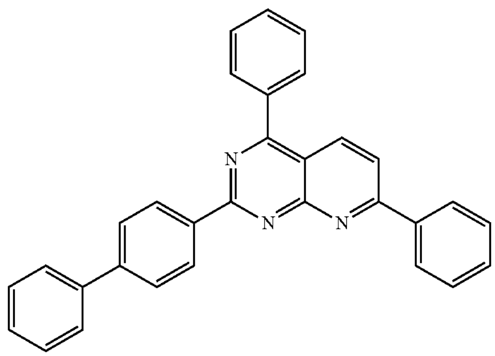
E1-25
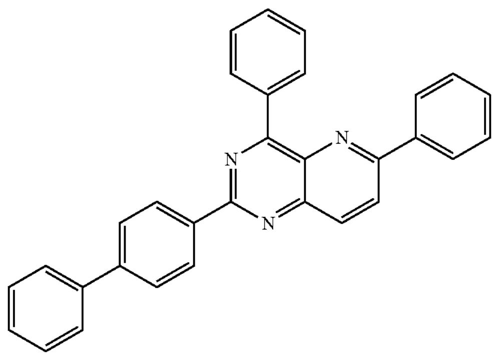
-continued
E1-26
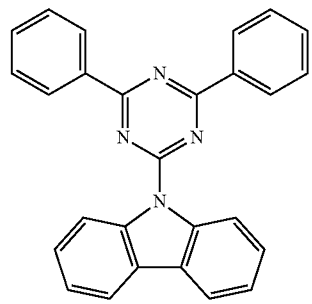
E1-27
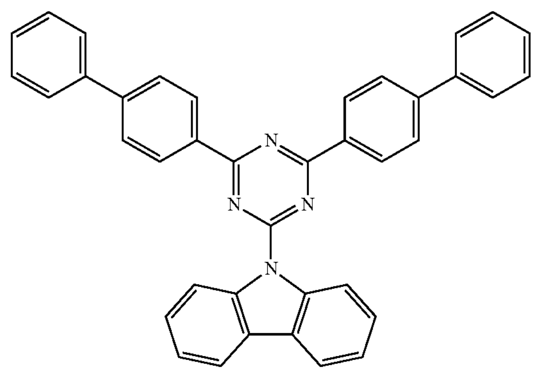
E1-28
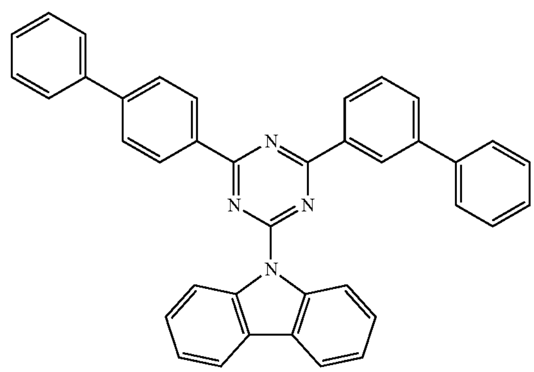
E1-29
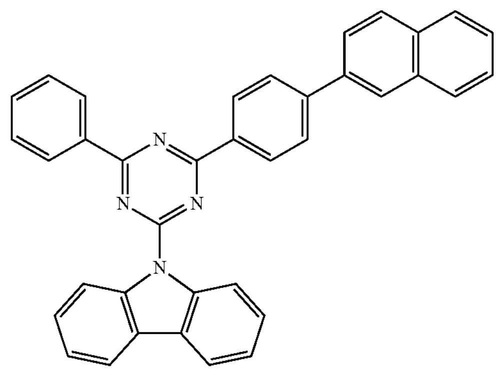

-continued
E1-30
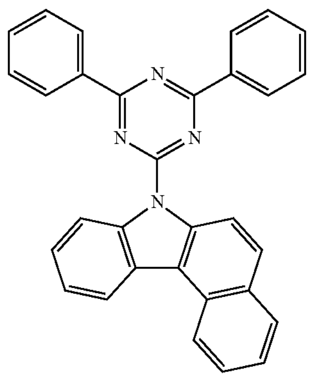
E1-31
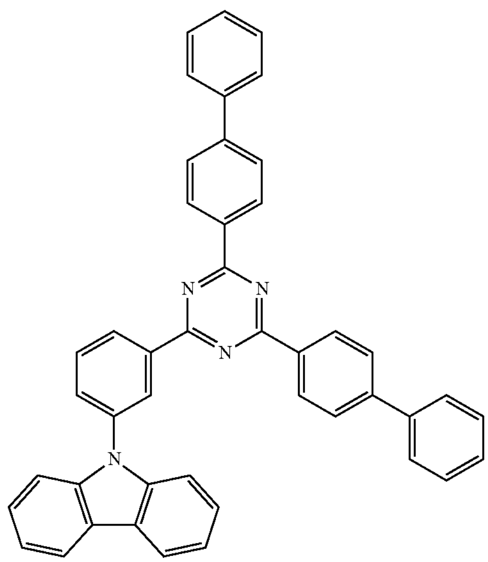
E1-32
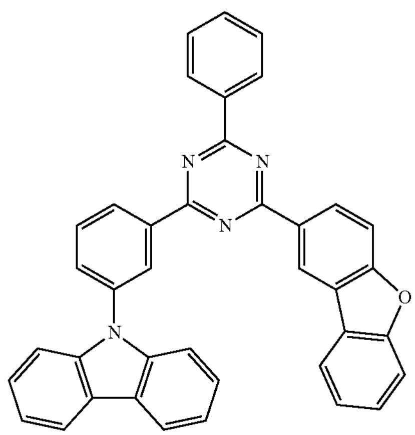
-continued
E1-33
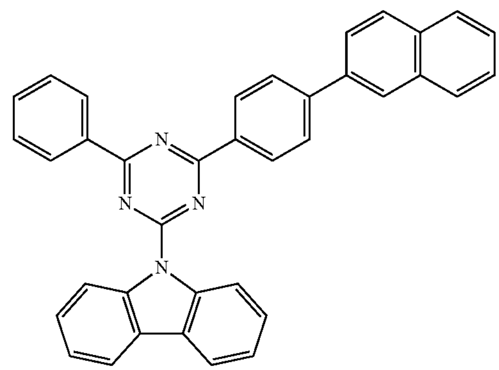
E1-34
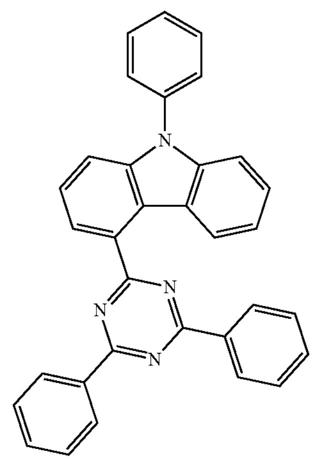
E1-35
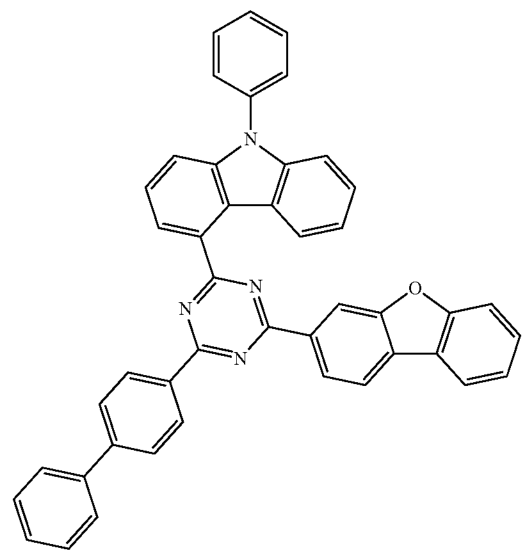

-continued
E1-36
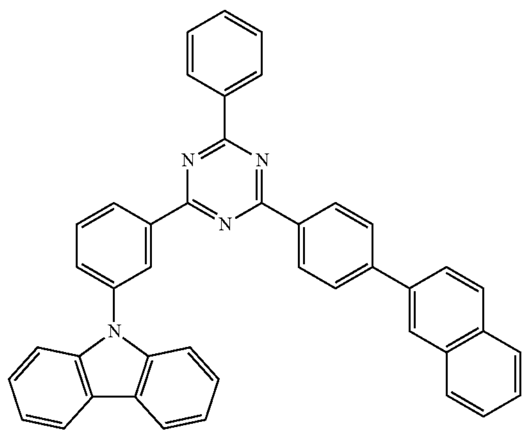
E1-37
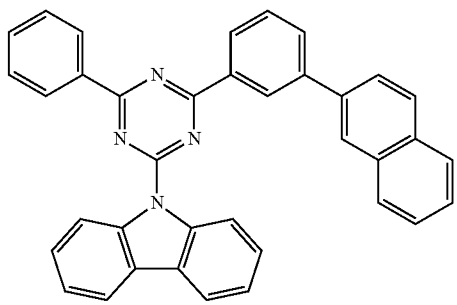
E1-38
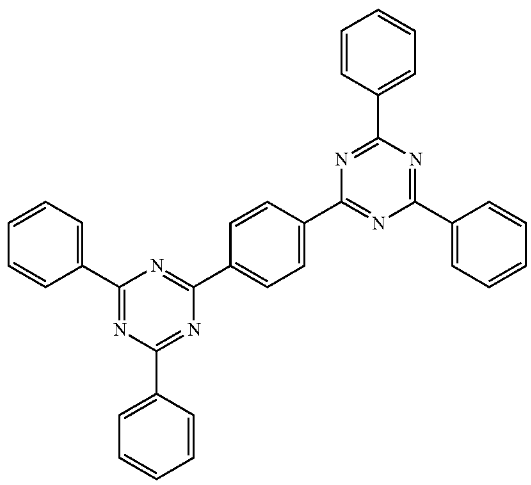
E1-39
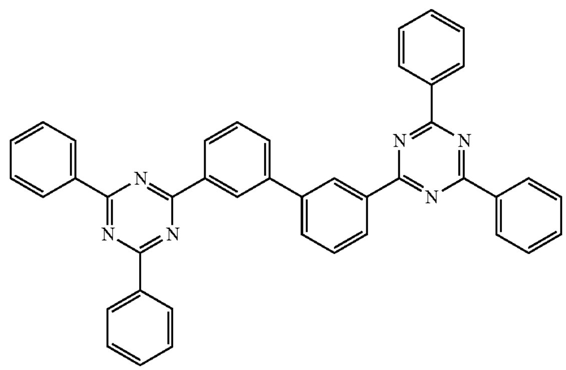
-continued
E1-40
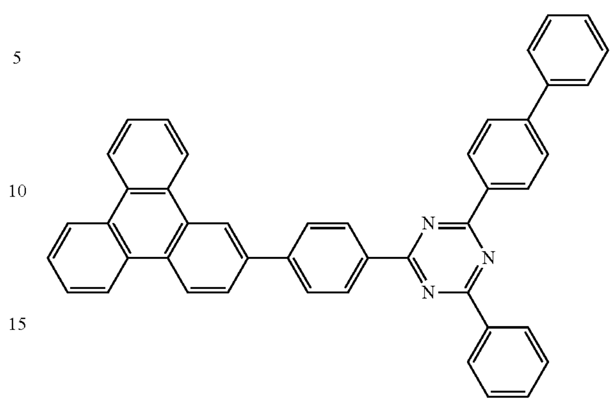
E1-41
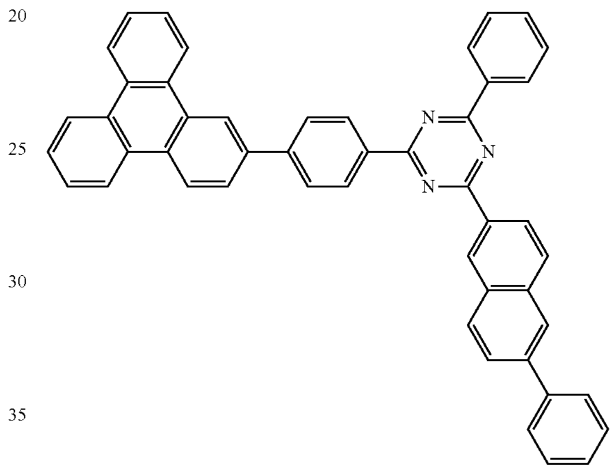
E1-42
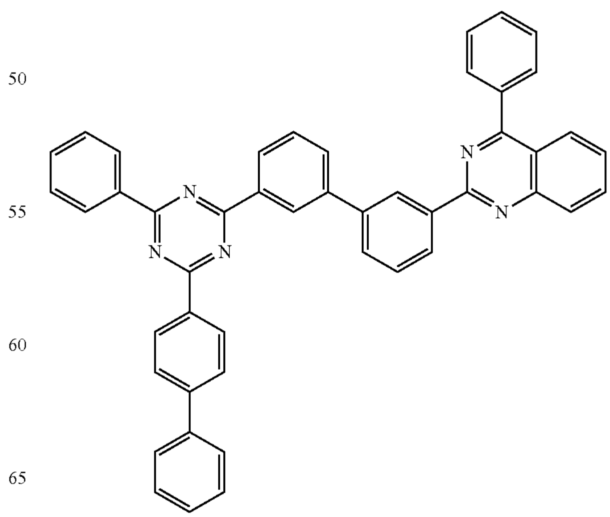

-continued
E1-43
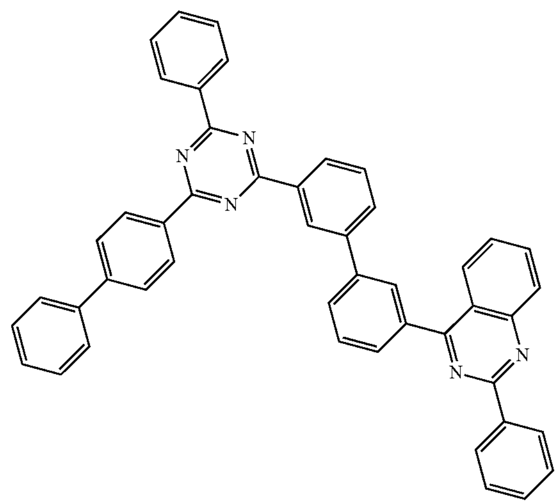
E1-44
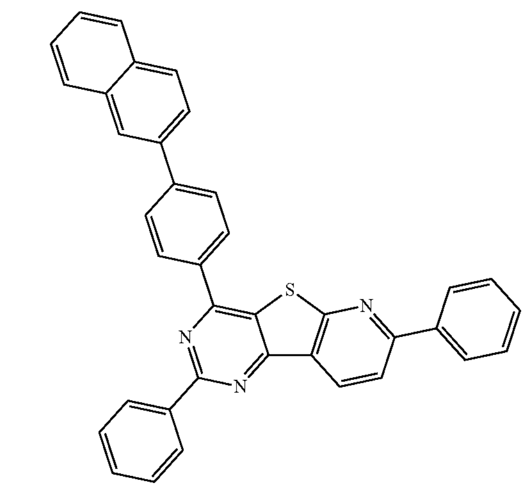
E1-45
-continued
E1-46
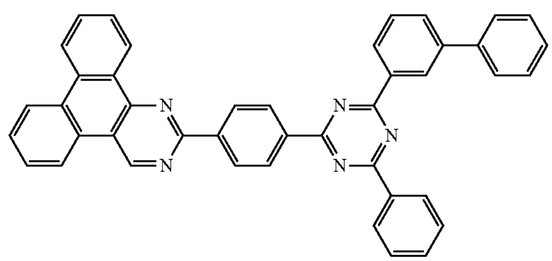
E1-47
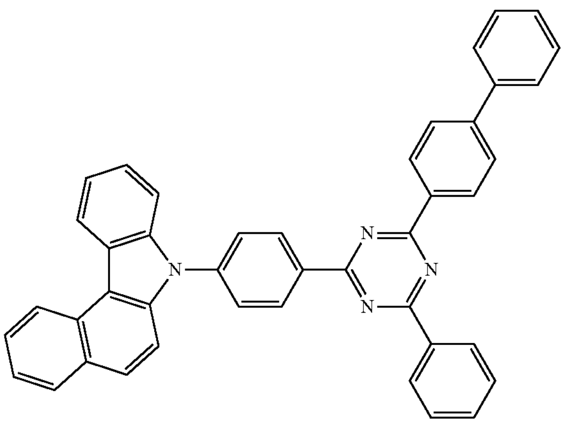
E1-48
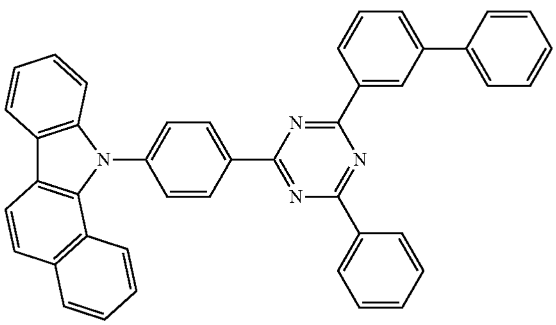
E1-49
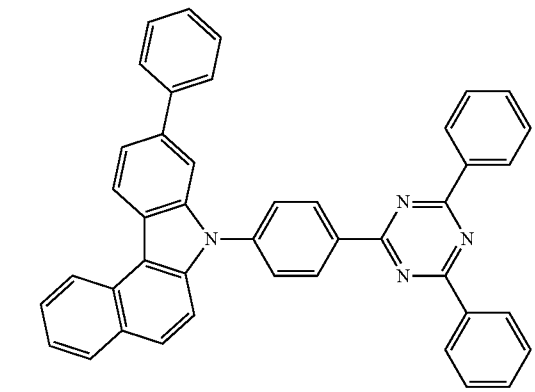

-continued
E1-50
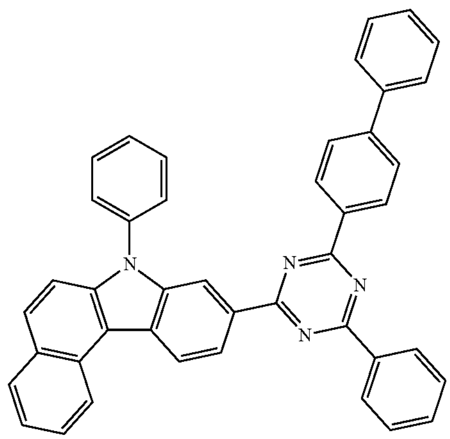
E1-51
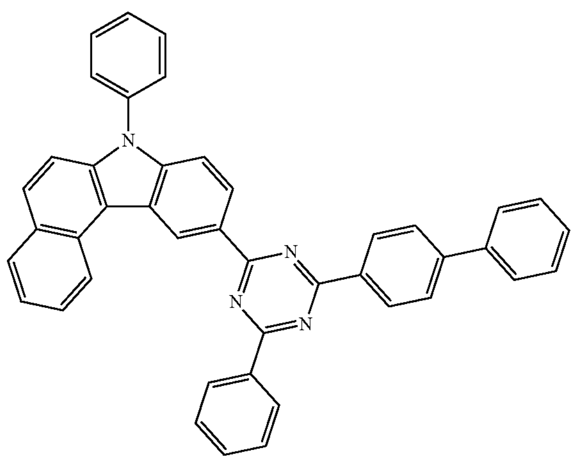
E1-52
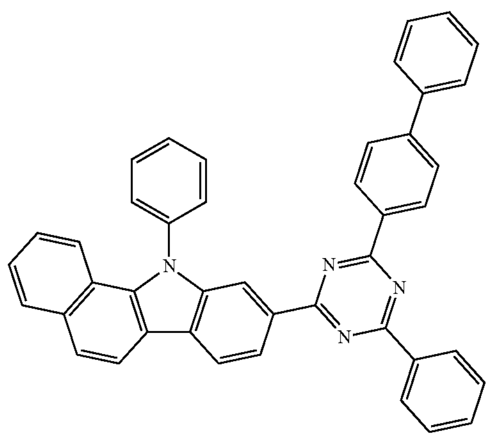
-continued
E1-53
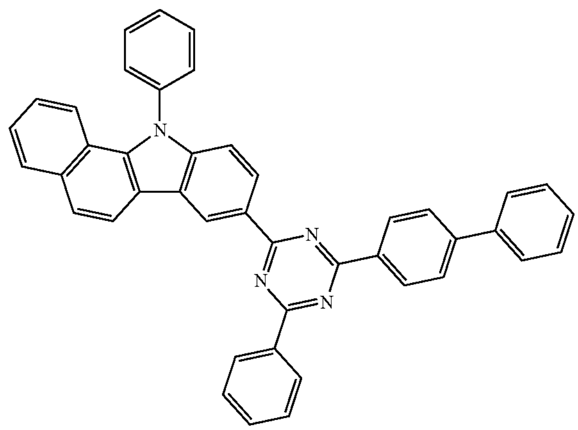
E1-54
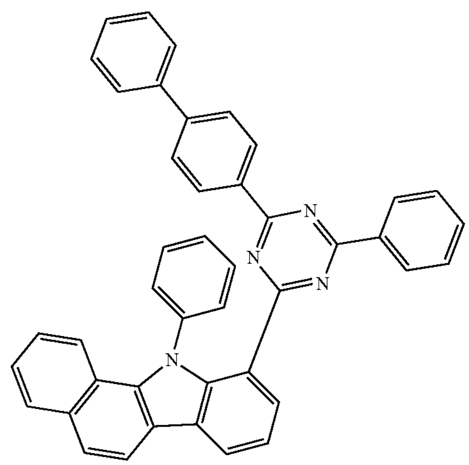
E1-55
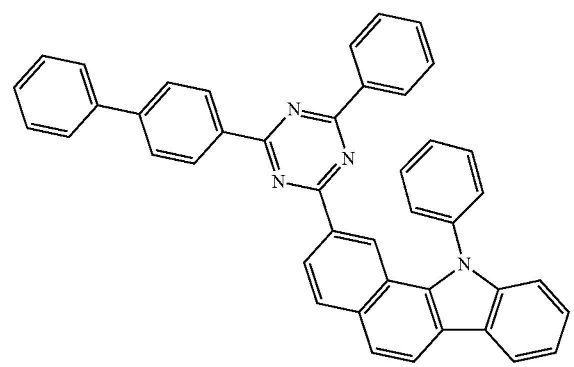

-continued
E1-56
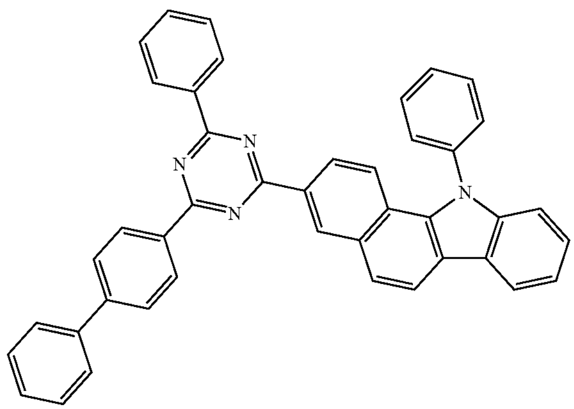
E1-57
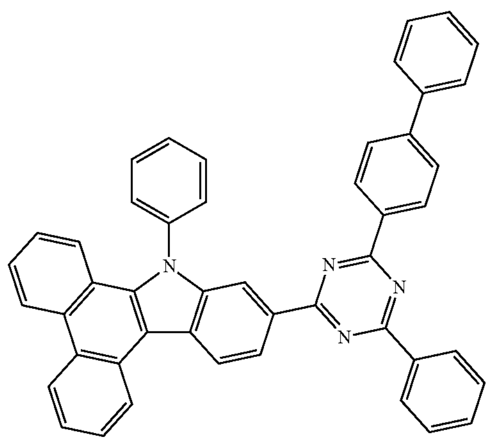
E1-58
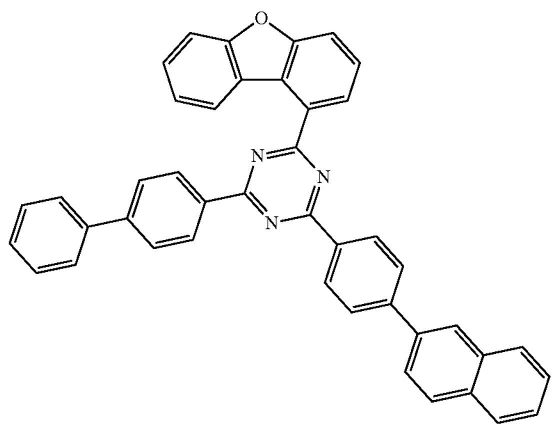
-continued
E1-59
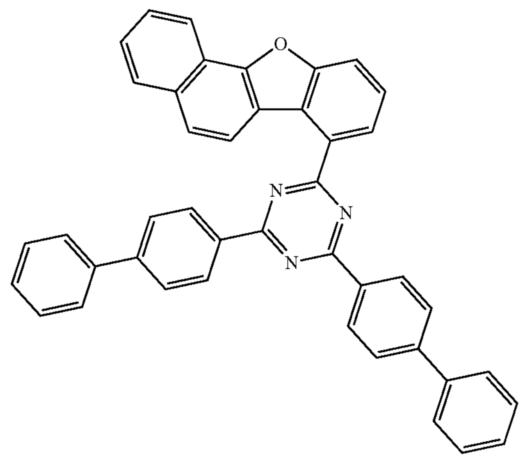
E1-60
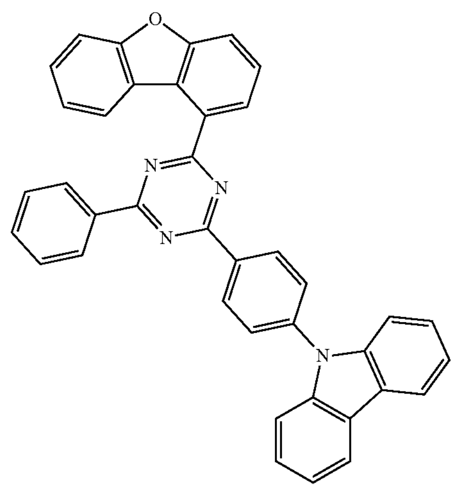
E1-61
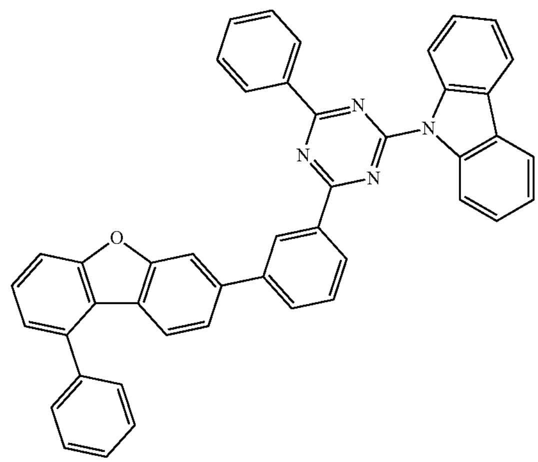

-continued

E1-62

E1-63

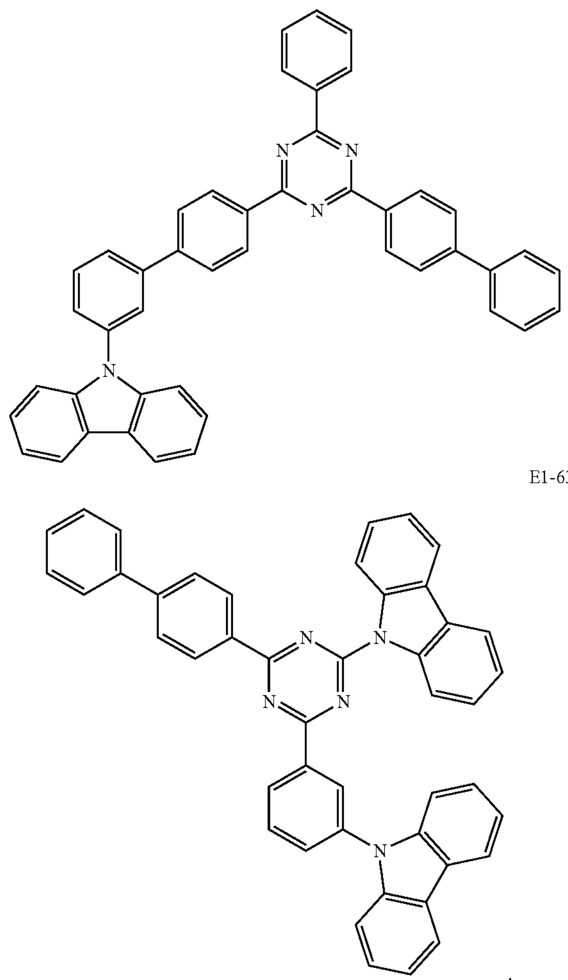

Figure 2:
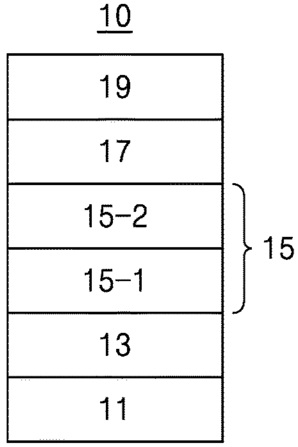
FIG. 2 is a schematic cross-sectional view of an organic light-emitting device according to an exemplary embodiment.

Description of FIG. 2

FIG. 2 is a schematic view of an exemplary embodiment of a light-emitting device, an organic light-emitting device 10. Hereinafter, a structure and a method of manufacturing the organic light-emitting device according to an embodiment will be described with reference to FIG. 2.

The organic light-emitting device 10 in FIG. 2 may include a first electrode 11, a hole transport region 13, an emission layer 15, an electron transport region 17, and a second electrode 19, which are sequentially layered in the stated order. The emission layer 15 may include the first emission layer 15-1 and the second emission layer 15-2.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be produced by depositing or sputtering, onto the substrate, a material for forming the first electrode 11. The first electrode 11 may be an anode. The material for forming the first electrode 11 may be selected from materials with a high work function for easy hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In some embodiments, the material for forming the first electrode 11 may be a metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO, but embodiments are not limited thereto.

The hole transport region 13 may be between the first electrode 11 and the emission layer 15.

The hole transport region 13 may include a hole injection layer, a hole transport layer, an electron blocking layer, a buffer layer, or a combination thereof.

The hole transport region 13 may include a hole injection layer only or a hole transport layer only. In some embodiments, the hole transport region 13 may include a hole injection layer and a hole transport layer which are sequentially stacked on the first electrode 11. In some embodiments, the hole transport region may include a hole injection layer, a hole transport layer, and an electron blocking layer, which are sequentially stacked on the first electrode 11.

When the hole transport region 13 includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum-deposition, for example, the vacuum deposition may be performed at a temperature in a range of about 100° C. to about 500° C., at a vacuum pressure in a range of about $10^{-8}$ torr to about $10^{-3}$ torr, and at a rate in a range of about 0.01 Angstroms per second (A/sec) to about 100 Å/sec, though the conditions may vary depending on a compound used as a hole injection material and a structure and thermal properties of a desired hole injection layer.

When a hole injection layer is formed by spin coating, the spin coating may be performed at a rate in a range of about 2,000 revolutions per minute (rpm) to about 5,000 rpm and at a temperature in a range of about 80° C. to 200° C. to facilitate removal of a solvent after the spin coating, though the conditions may vary depending on a compound used as a hole injection material and a structure and thermal properties of a desired hole injection layer, but embodiments are not limited thereto.

The conditions for forming a hole transport layer and an electron blocking layer may be inferred from the conditions for forming the hole injection layer.

The hole transport region 13 may include m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor-sulfonic acid (PANI/CSA), polyaniline/poly(4-styrene sulfonate) (PANI/PSS), a compound represented by Formula 201, a compound represented by Formula 202, or any combination thereof:

-continued
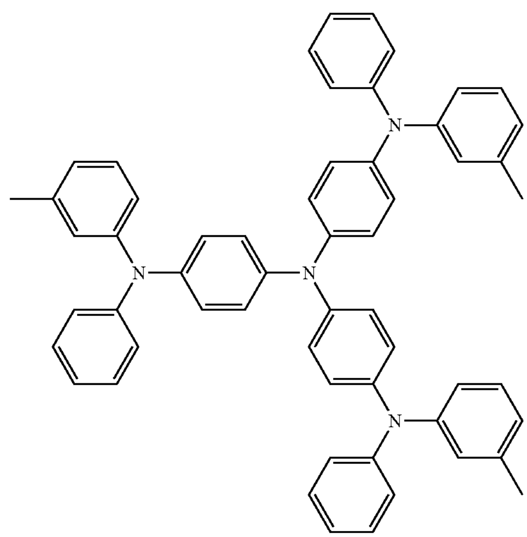
m-MTDATA
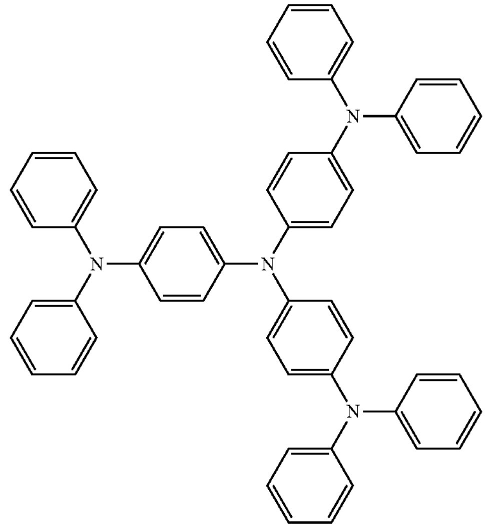
TDATA
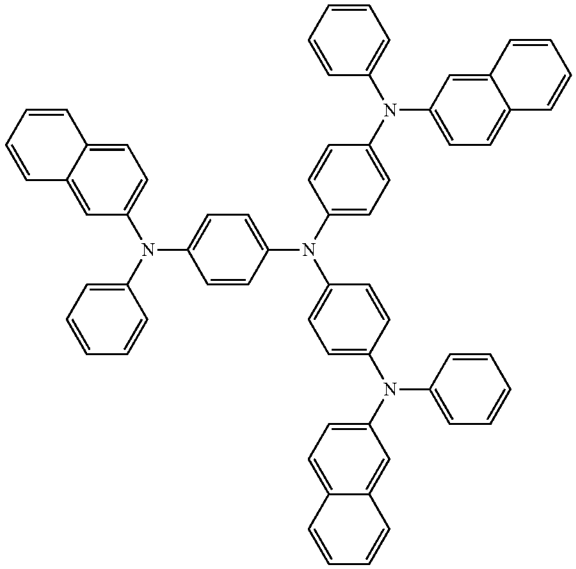
2-TNATA
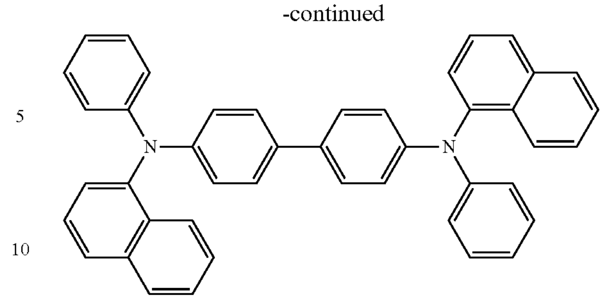
NPB
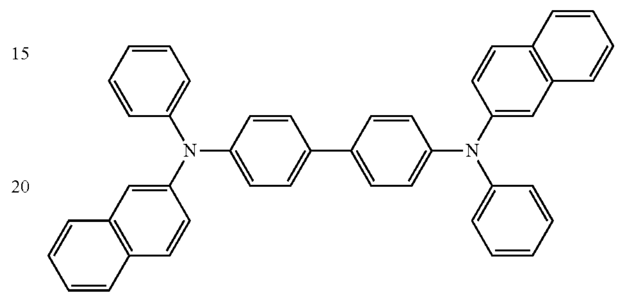
β-NPB
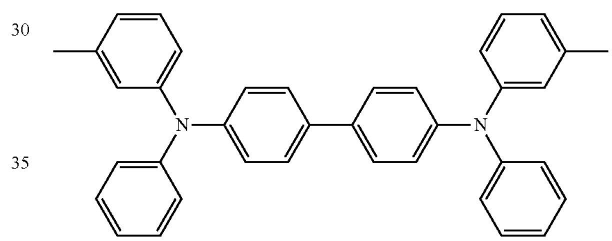
TPD
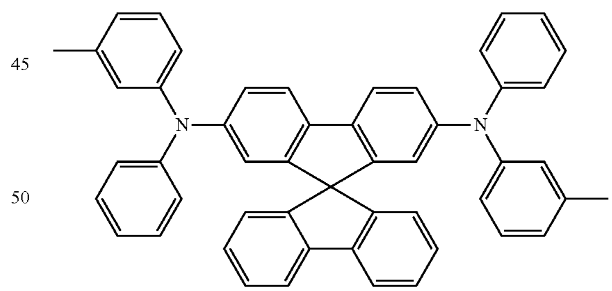
Spiro-TPD
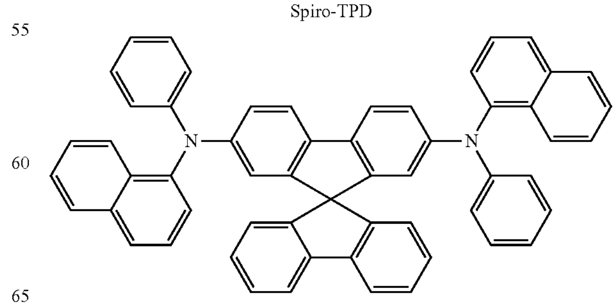
Spiro-NPB -continued

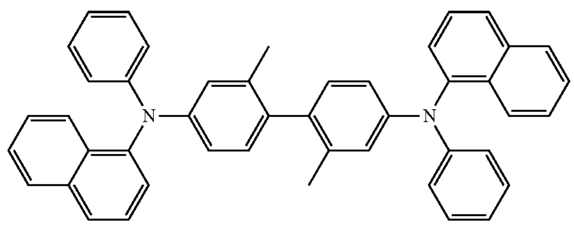

methylated NPB

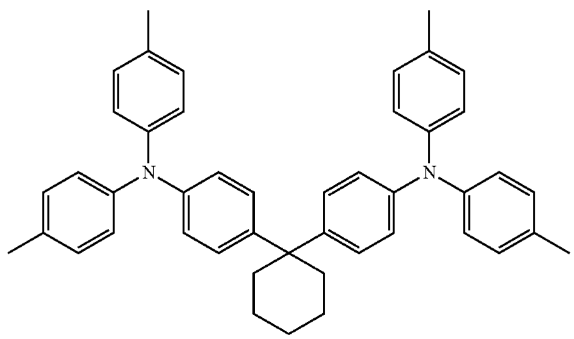

TAPC

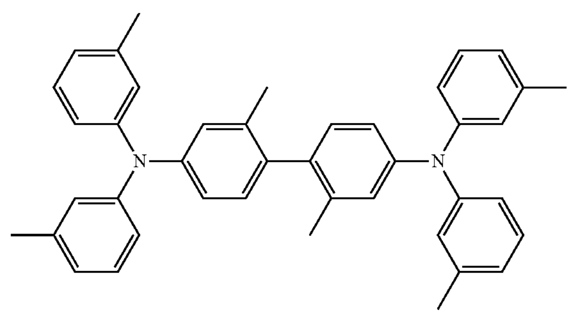

HMTPD

Formula 201

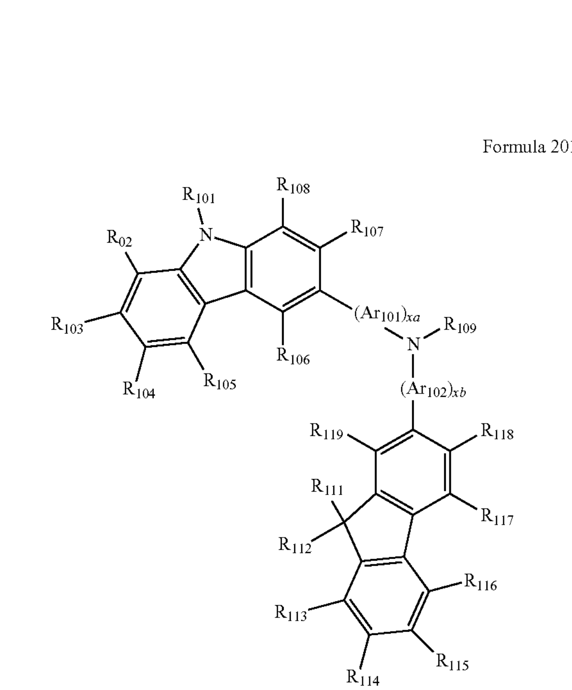

-continued

Formula 202

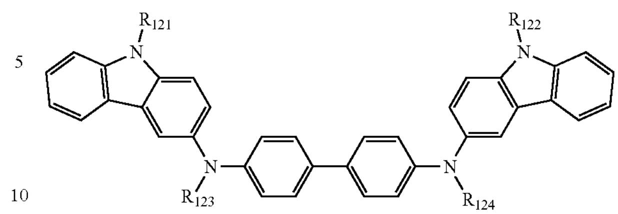

wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5. In some embodiments, xa and xb may each independently be 0, 1, or 2. In some embodiments, xa may be 1, and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), or a $C_1$-$C_{10}$ alkoxy group (e.g., a methoxy group, an ethoxy group, a propoxy group, a butoxy group, or a pentoxy group);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_{20}$ alkyl group, a $C_1$-$C_{20}$ alkoxy group, a phenyl group, a naphthyl group, an anthracenyl group, a pyridinyl group, or any combination thereof.

In some embodiments, the compound represented by Formula 201 may be represented by Formula 201A:

Formula 201A

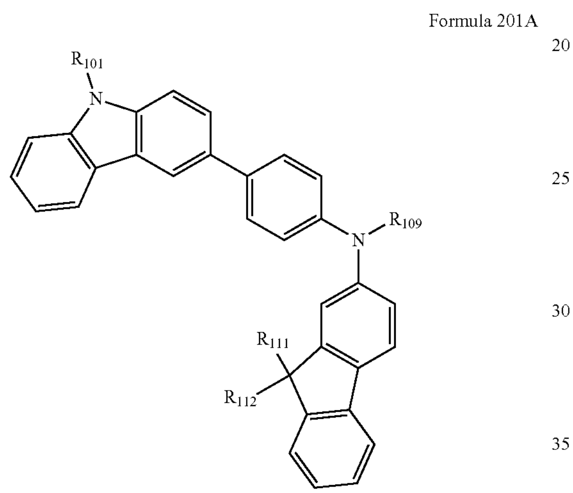

wherein, in Formula 201A, $R_{101}$, $R_{111}$, $R_{112}$, and $R_{109}$ may respectively be understood by referring to the descriptions of $R_{101}$, $R_{111}$, $R_{112}$, and $R_{109}$ provided herein.

In some embodiments, the hole transport region 13 may include one of Compounds HT1 to HT20 or any combination thereof:

HT1

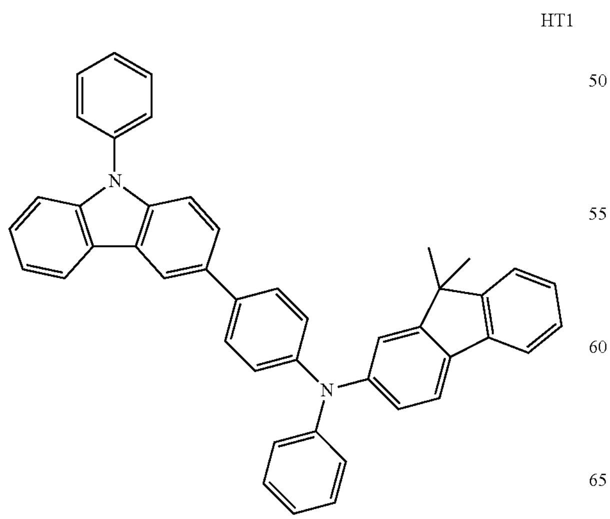

-continued

HT2

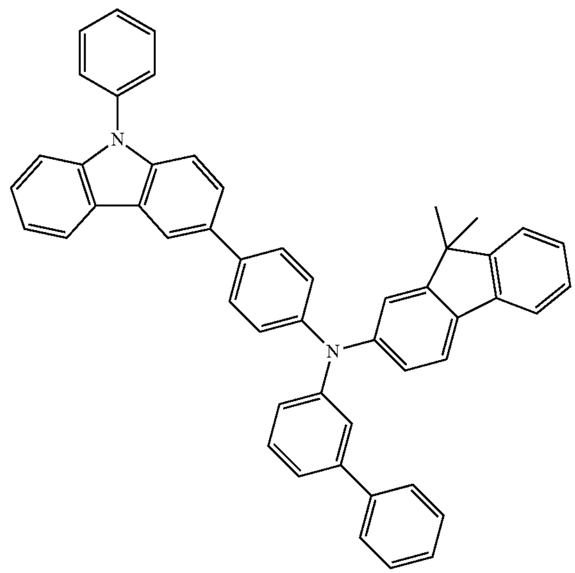

HT3

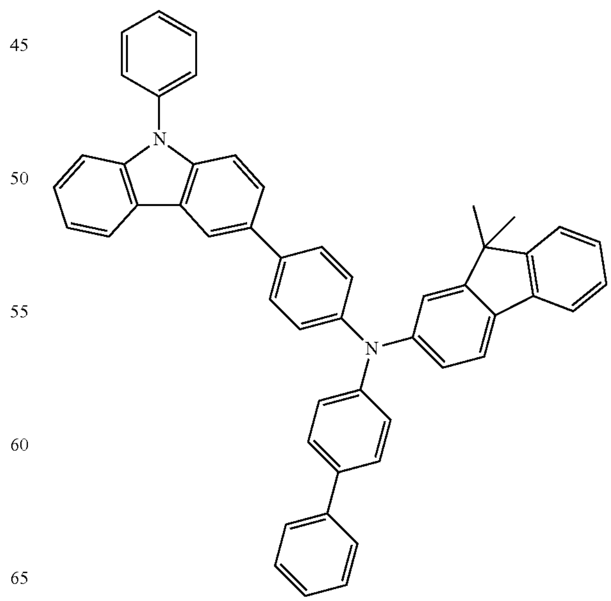

-continued
HT4
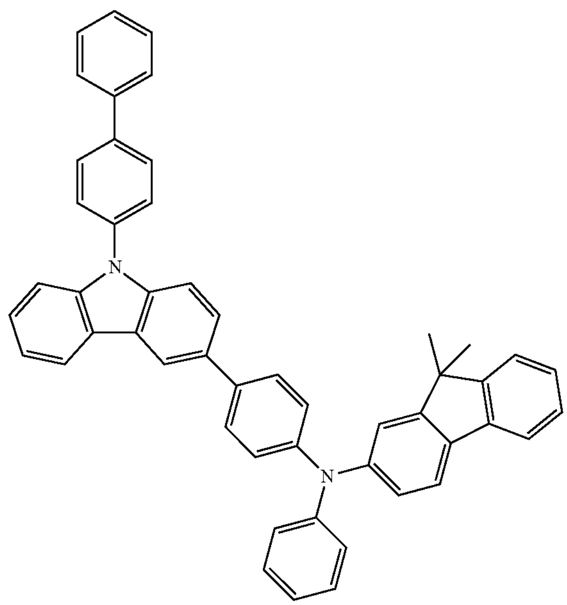
HT5
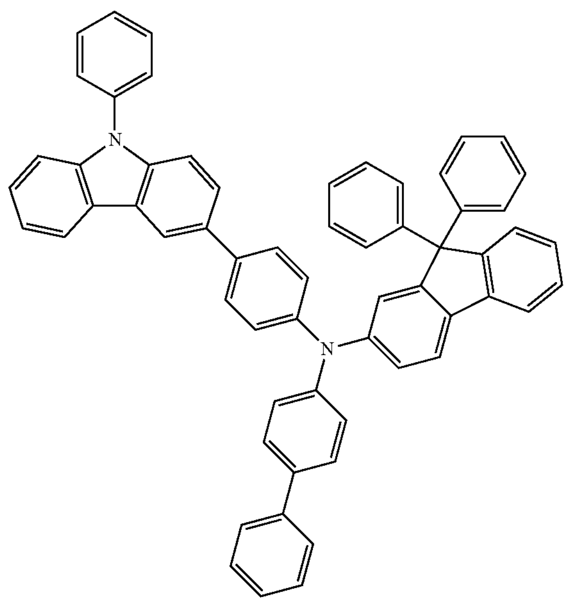
-continued
HT6
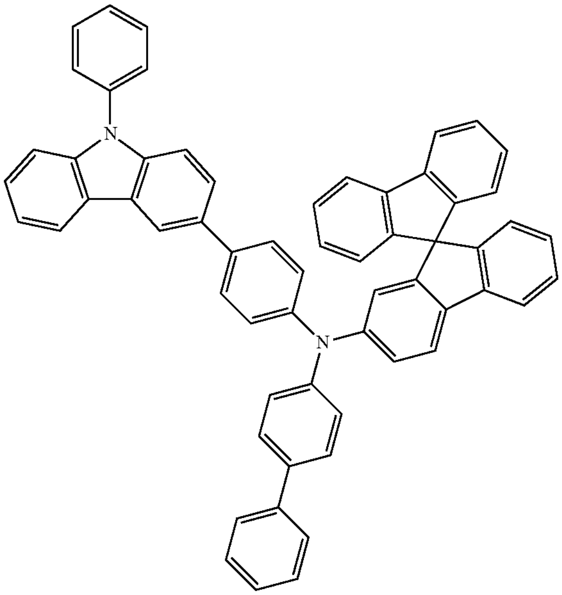
HT7
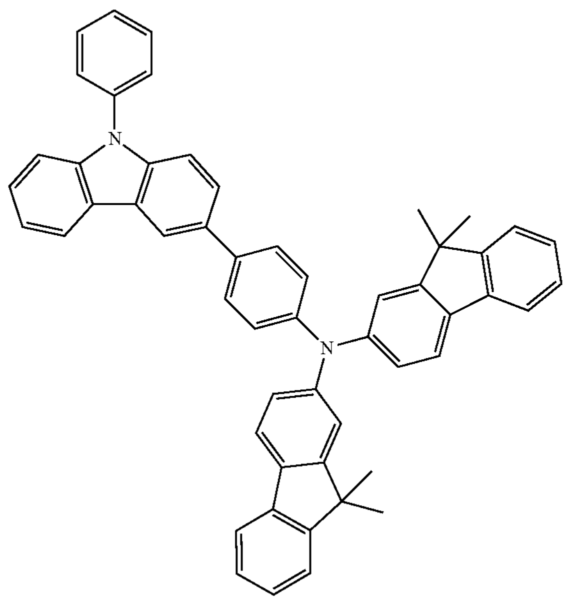

-continued
HT8
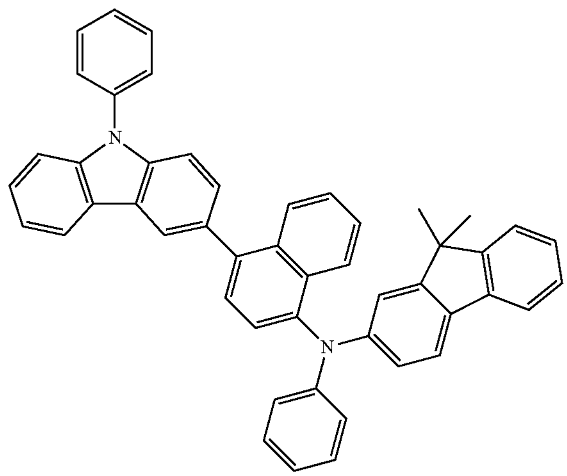
HT9
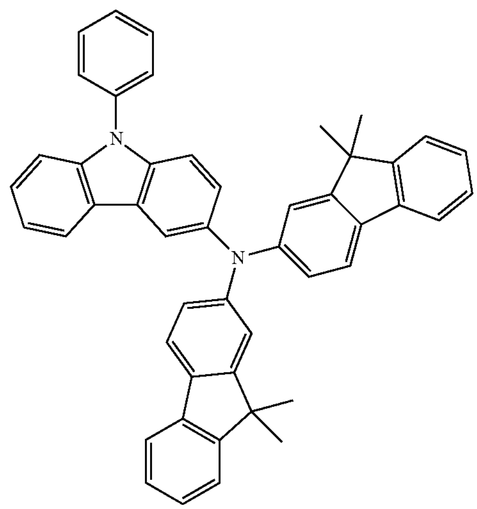
HT10
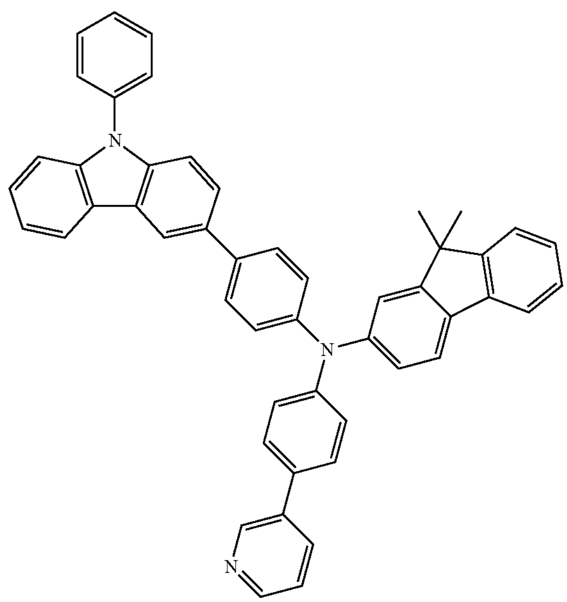
-continued
HT11
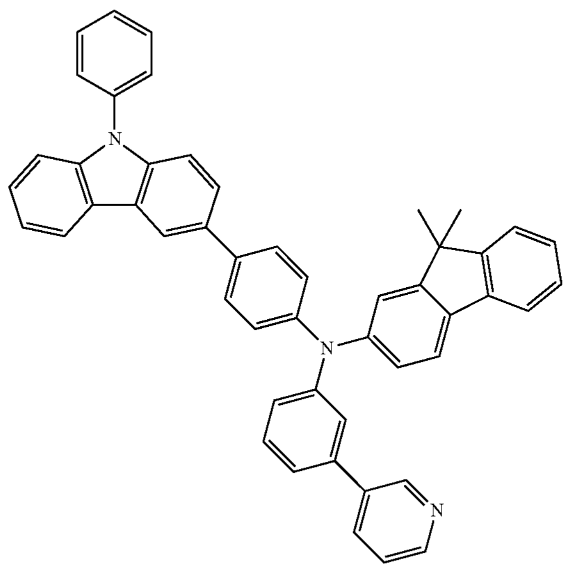
HT12
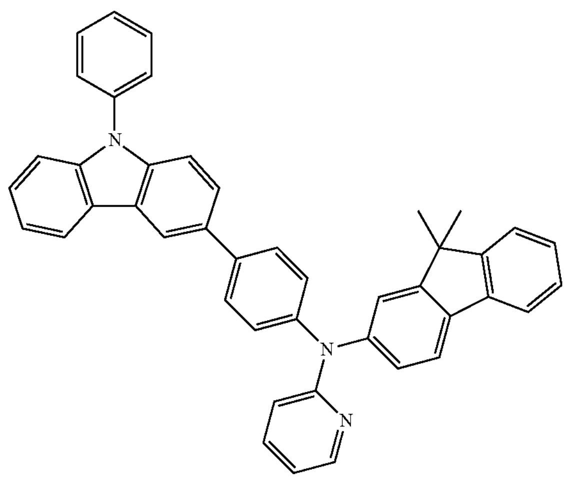
HT13
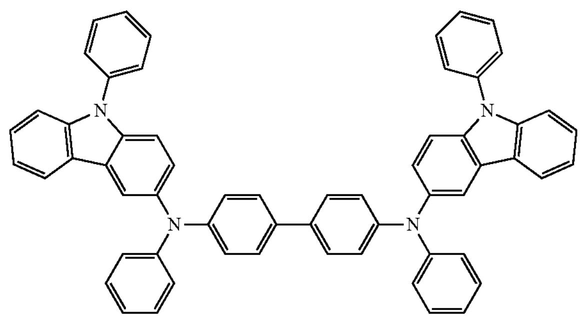

-continued

HT14

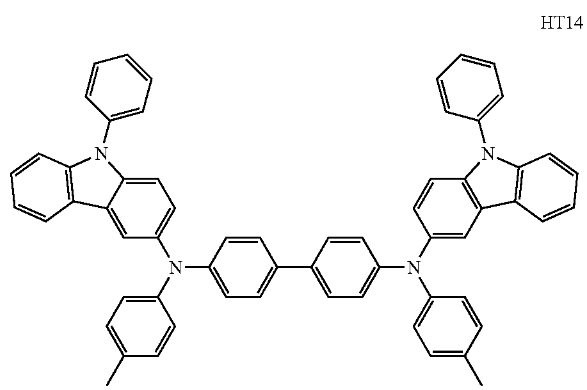

HT15

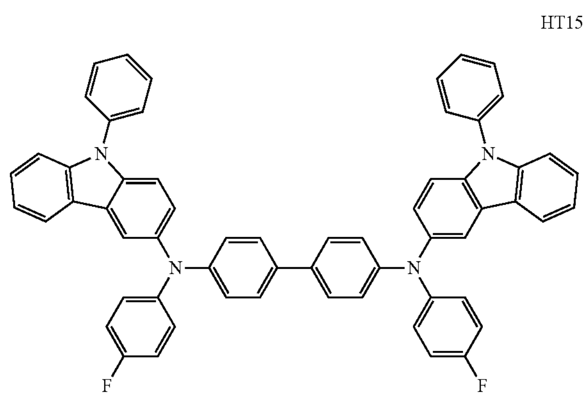

HT16

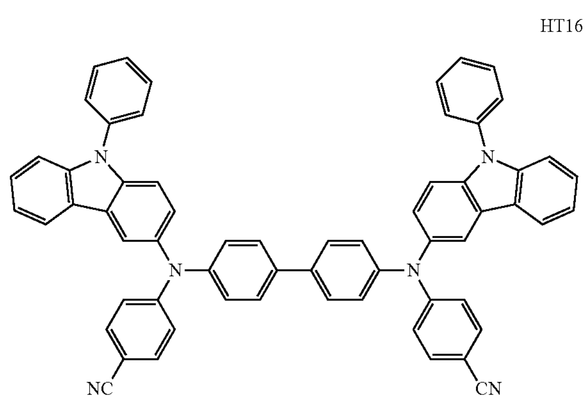

HT17

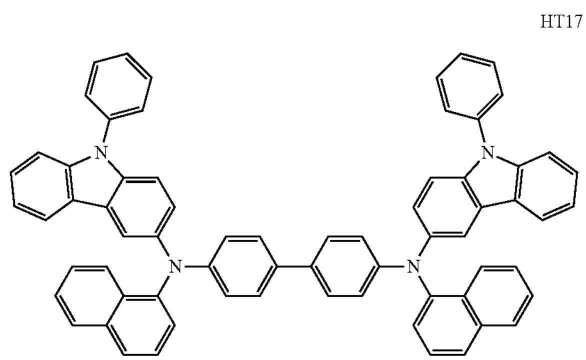

-continued

HT18

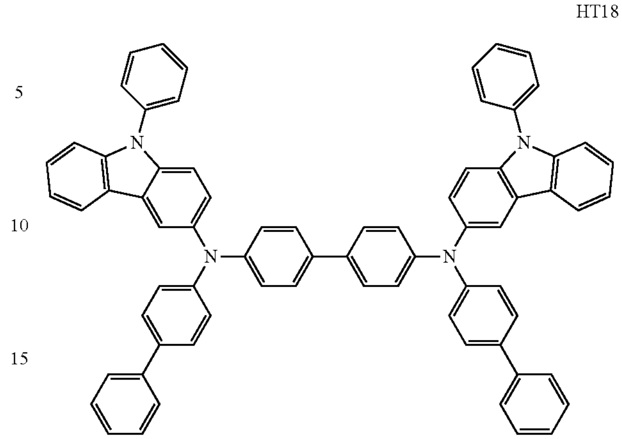

HT19

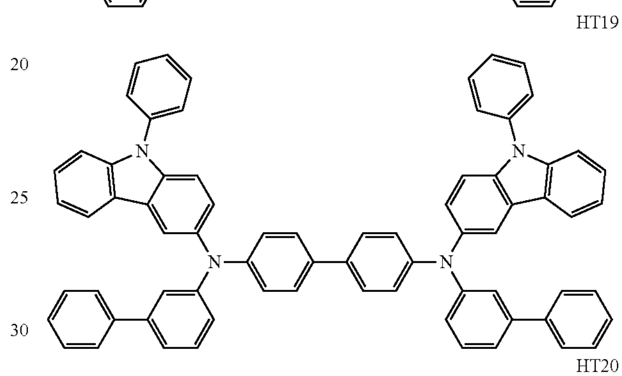

HT20

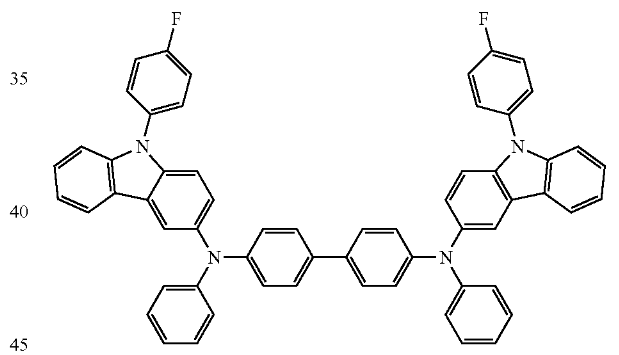

The thickness of the hole transport region 13 may be in a range of about 100 Angstroms (Å) to about 10,000 Å, for example, about 100 Å to about 1,000 Å. When the hole transport region 13 includes a hole injection layer, a hole transport layer, an electron blocking layer, or any combination thereof, the thickness of the hole injection layer may be in a range of about 100 Å to about 10,000 Å, for example, about 100 Å to about 1,000 Å, the thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, excellent hole transport characteristics may be obtained without a substantial increase in driving voltage.

The hole transport region 13 may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may be a quinone derivative, a metal oxide, a compound containing a cyano group, or any combination thereof, but embodiments are not limited thereto. In some embodiments, the p-dopant may be a quinone derivative, such as tetracyanoquinodimethane (TCNQ), a 2,3,5,6-tetrafluoro-tetracyano-1,4-benzoquinonedimethane (F4-TCNQ), or F6-TCNNQ; a metal oxide, such as a tungsten oxide or a molybdenum oxide; a compound containing a cyano group, such as Compound HT-D1; or any combination thereof:

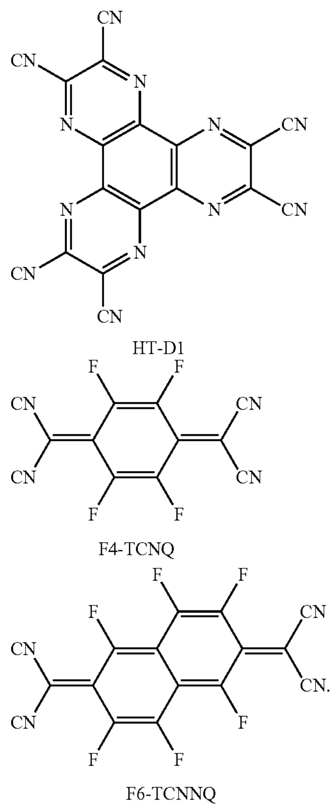

HT-D1

F4-TCNQ

F6-TCNNQ

The hole transport region 13 may further include a buffer layer.

The buffer layer may compensate for an optical resonance distance depending on a wavelength of light emitted from the emission layer to improve the efficiency of an organic light-emitting device.

When the hole transport region 13 includes an electron blocking layer, a material for forming the electron blocking layer may include the material for forming a hole transport region 13, the material for forming a host, or any combination thereof. In some embodiments, when the hole transport region includes an electron blocking layer, mCP, Compound H1-8 of Group 5-2, or the like may be used for forming the electron blocking layer.

The emission layer 15 may be formed on the hole transport region 13 by using one or more suitable methods, such as vacuum deposition, spin coating, casting, or LB deposition. When the emission layer 15 is formed by vacuum deposition or spin coating, vacuum deposition and coating conditions for forming the emission layer may be generally similar to those conditions for forming a hole injection layer, though the conditions may vary depending on a compound that is used.

The emission layer 15 may include the first emission layer 15-1 and the second emission layer 15-2 as described herein.

In some embodiments, the content (weight) of the dopant in the first emission layer 15-1 may be in a range of about 0.01 parts to about 20 parts by weight, based on 100 parts by weight of the total weight of the first hole-transporting compound and the first electron-transporting compound.

In some embodiments, the content (weight) of the dopant in the first emission layer 15-1 may be in a range of about 0.01 parts to about 20 parts by weight, based on 100 parts by weight of the total weight of the dopant, the first hole-transporting compound and the first electron-transporting compound.

In some embodiments, the content (weight) of the dopant in the second emission layer 15-2 may be in a range of about 0.01 parts to about 20 parts by weight, based on 100 parts by weight of the total weight of the second hole-transporting compound and the second electron-transporting compound.

In some embodiments, the content (weight) of the dopant in the second emission layer 15-2 may be in a range of about 0.01 parts to about 20 parts by weight, based on 100 parts by weight of the total weight of the dopant, the second hole-transporting compound and the second electron-transporting compound.

The thickness of the emission layer 15 may be in a range of about 100 Å to about 1,000 Å, and in some embodiments, about 200 Å to about 600 Å. When the thickness of the emission layer 15 is within any of these ranges, improved luminescence characteristics may be obtained without a substantial increase in driving voltage.

Then, the electron transport region 17 may be over the emission layer 15.

The electron transport region 17 may include a hole blocking layer, an electron transport layer, an electron injection layer, or a combination thereof.

In some embodiments, the electron transport region 17 may have a hole blocking layer/an electron transport layer/an electron injection layer structure or an electron transport layer/an electron injection layer structure. The electron transport layer may have a single-layered structure or a multi-layered structure including two or more different materials.

The conditions for forming a hole blocking layer, an electron transport layer, and an electron injection layer of the electron transport region 17 may be understood by referring to the conditions for forming the hole injection layer.

When the electron transport region 17 includes a hole blocking layer, the hole blocking layer may include, for example, BCP, Bphen, BAlq, or any combination thereof:

BCP

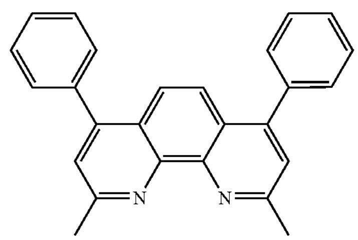

-continued

Bphen

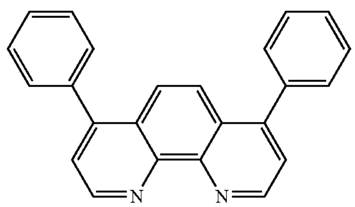

.

In some embodiments, the hole blocking layer may include any suitable host material, the material for forming an electron transport layer described herein, the material for forming an electron injection layer described herein, or any combination thereof.

The thickness of the hole blocking layer may be in a range of about 20 Å to about 1,000 Å, for example, about 300 Å to about 300 Å. When the thickness of the hole blocking layer is within any of these ranges, excellent hole blocking characteristics may be obtained without a substantial increase in driving voltage.

The electron transport layer may include BCP, Bphen, TPBi, $Alq_3$, BAlq, TAZ, NTAZ, or any combination thereof:

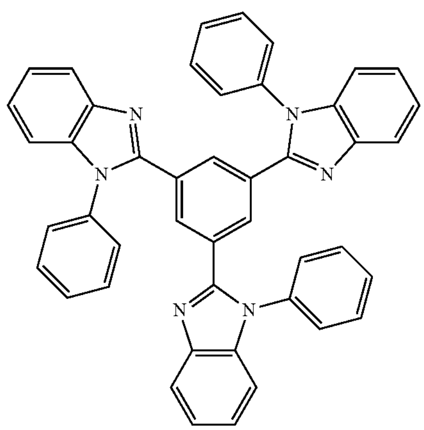

TPBi

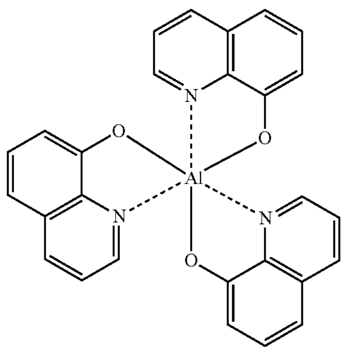

$Alq_3$

-continued

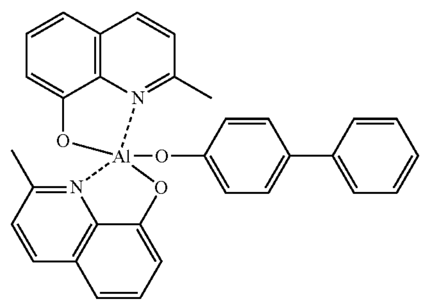

BAlq

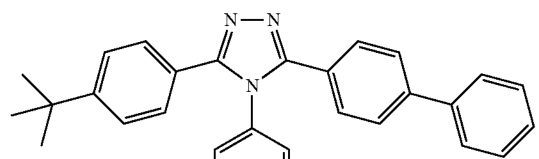

TAZ

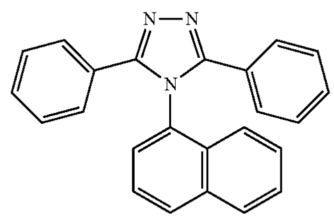

NTAZ

.

In some embodiments, the electron transport layer may include at least one of Compounds ET1 to ET25.

ET1

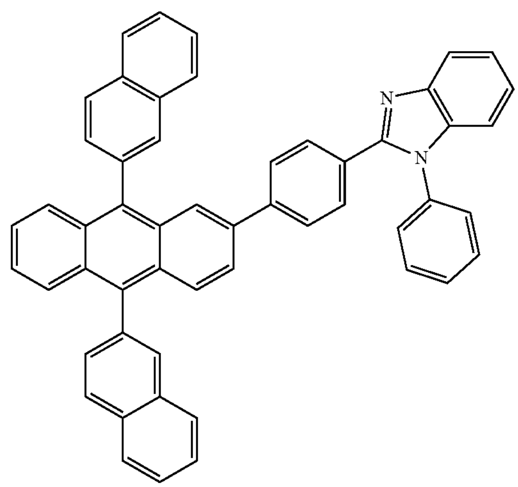

-continued
ET2
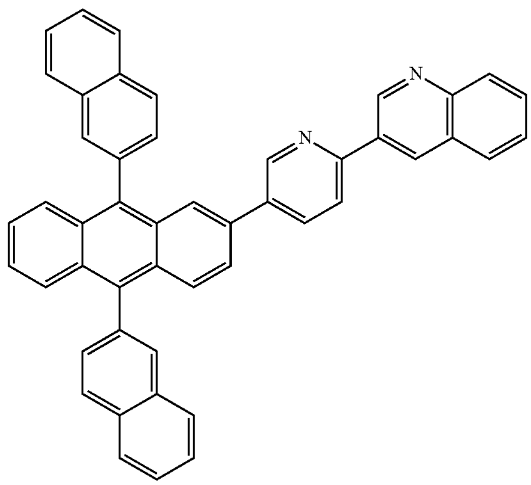
ET3
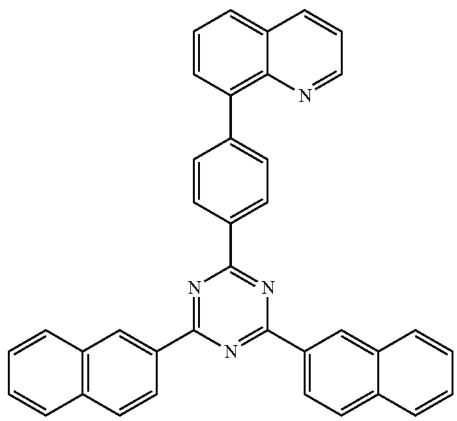
ET4
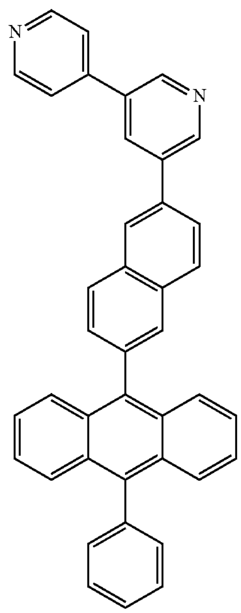
-continued
ET5
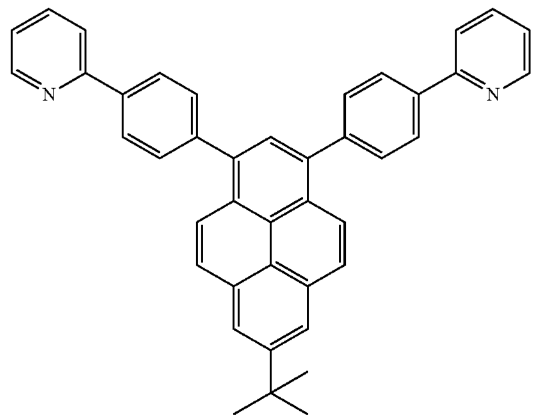
ET6
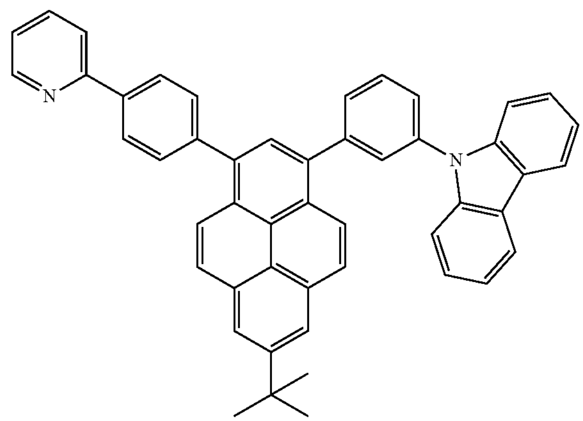
ET7
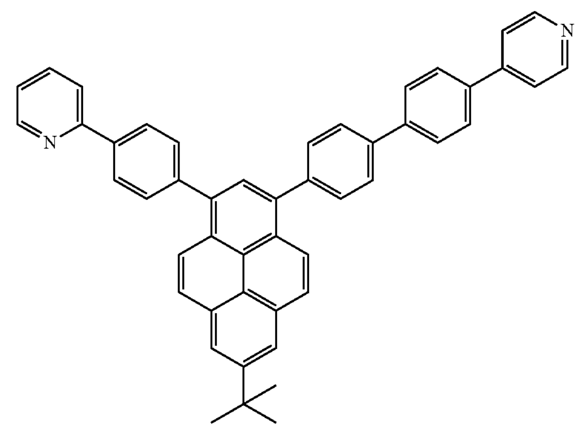

-continued
ET8
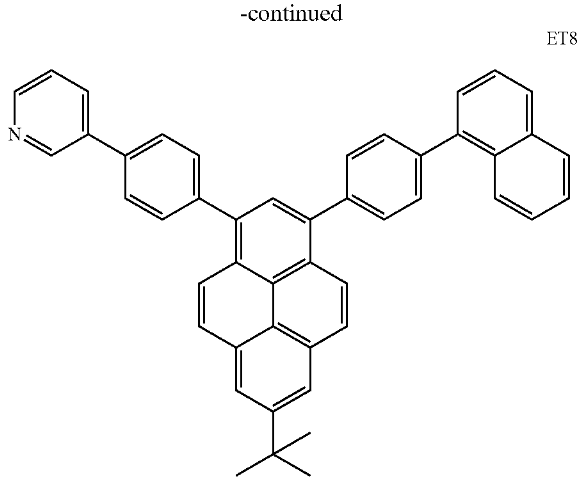
ET9
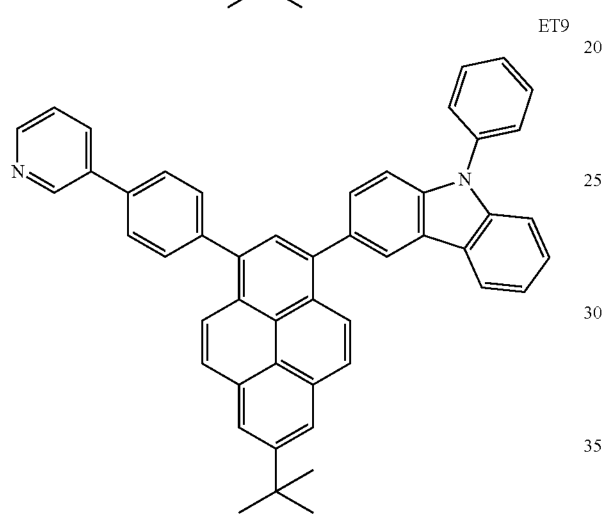
ET10
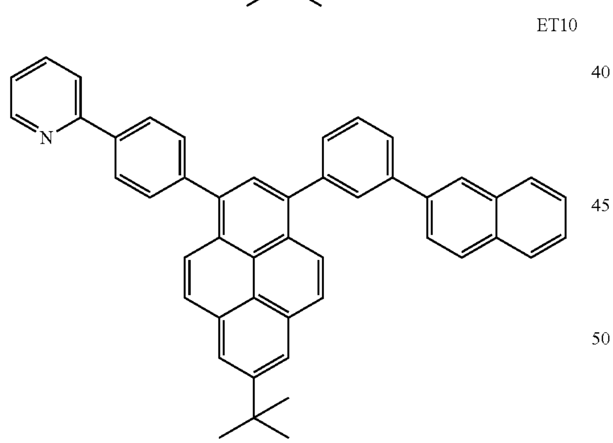
ET11
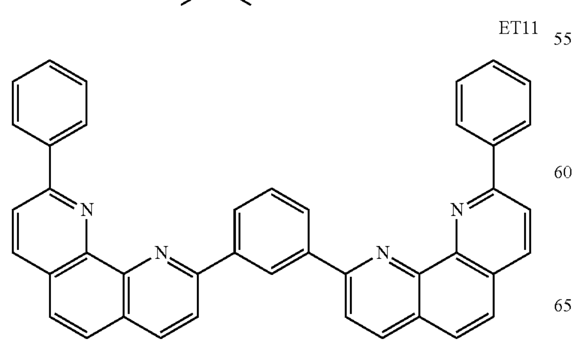
-continued
ET12
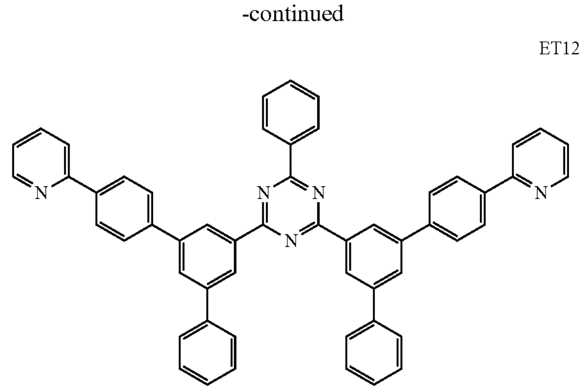
ET13
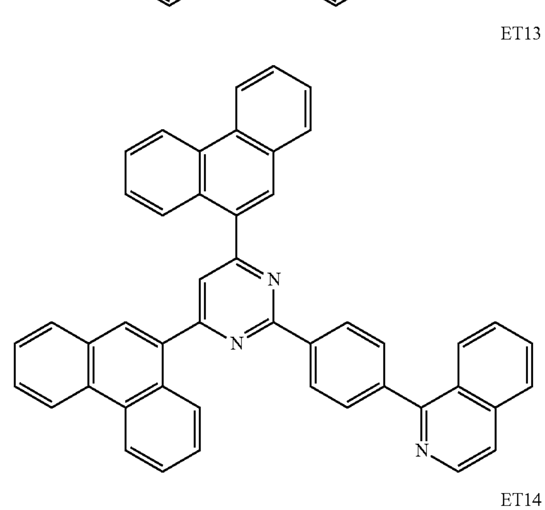
ET14
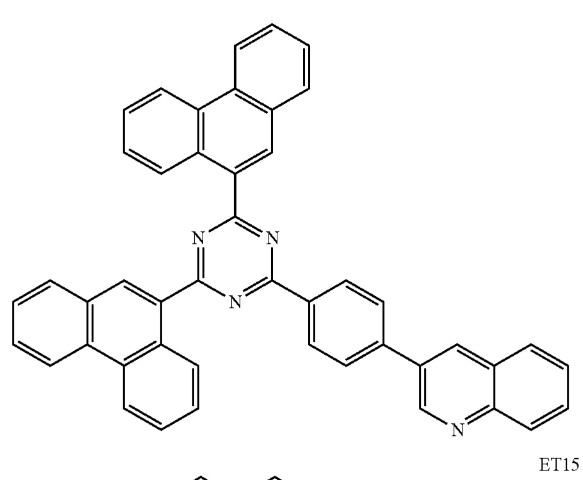
ET15
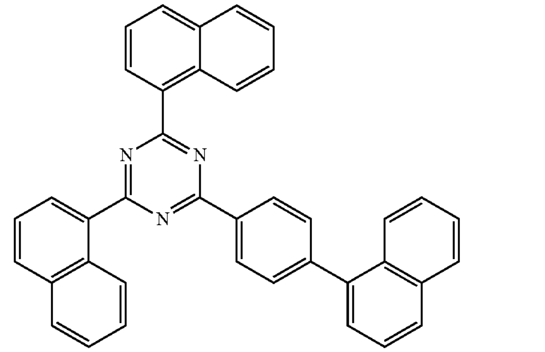

-continued
ET16
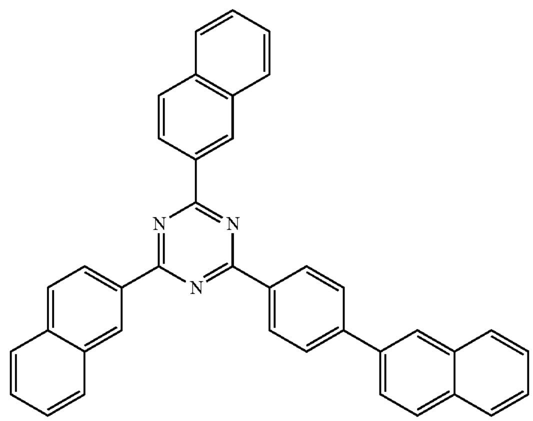
ET17
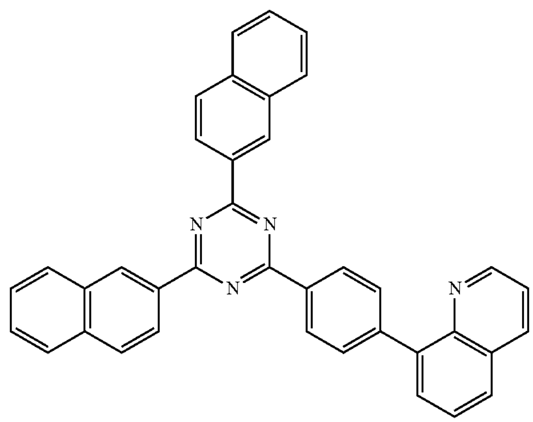
ET18
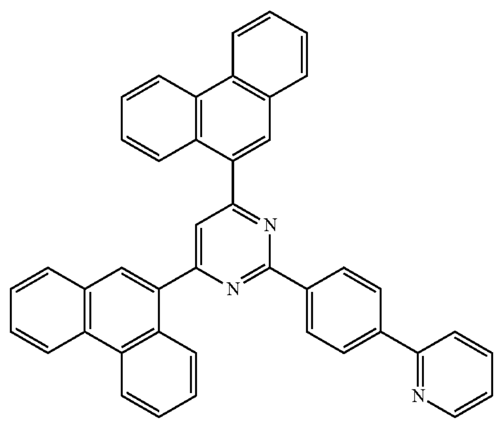
-continued
ET19
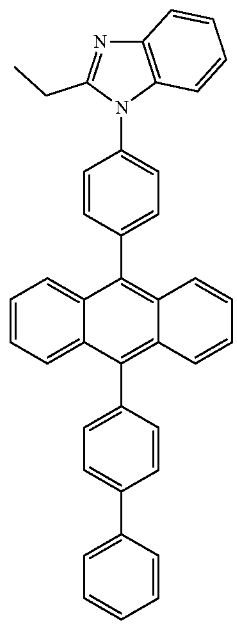
ET20
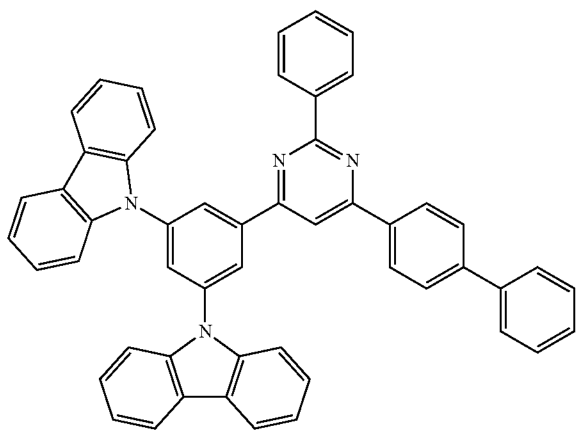
ET21
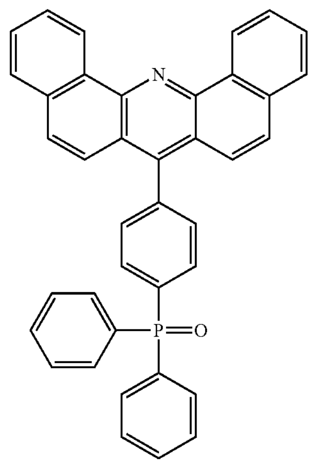

-continued

ET22

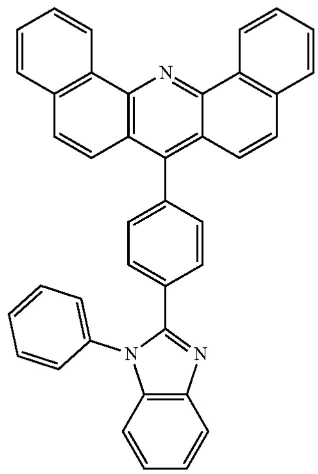

ET23

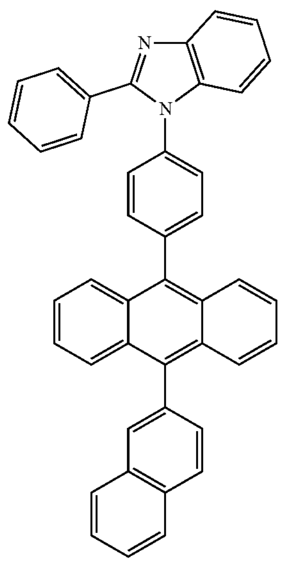

ET24

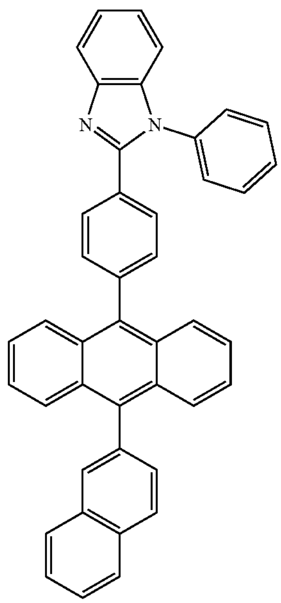

-continued

ET25

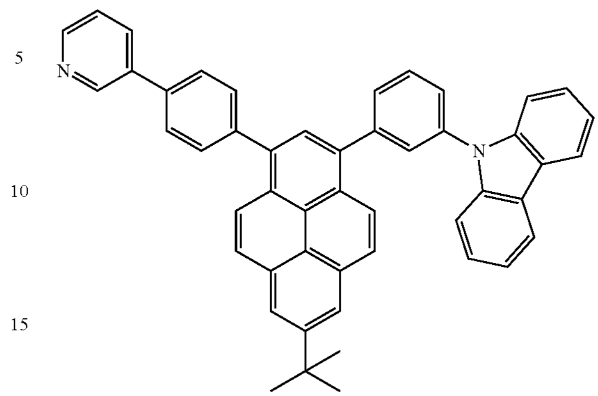

The thickness of the electron transport layer may be in a range of about 100 Å to about 1,000 Å, and in some embodiments, about 150 Å to about 500 Å. When the thickness of the electron transport layer is within any of these ranges, excellent electron transport characteristics may be obtained without a substantial increase in driving voltage.

The electron transport layer may further include a material containing metal, in addition to the materials described above.

The material containing metal may include a $L_1$ complex. The $L_1$ complex may include, e.g., Compound ET-D1 or Compound ET-D2:

ET-D1

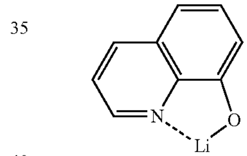

ET-D2

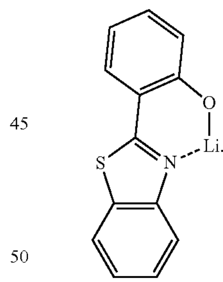

The electron transport region 17 may include an electron injection layer that facilitates electron injection from the second electrode 19.

The electron injection layer may include LiF, NaCl, CsF, $Li_2O$, BaO, or any combination thereof.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

The second electrode 19 may be on the electron transport region 17. The second electrode 19 may be a cathode. A material for forming the second electrode 19 may be a material with a relatively low work function, such as a metal, an alloy, an electrically conductive compound, and a mixture thereof. Examples of the material for forming the second electrode 19 may include lithium (Li), magnesium (Mg), aluminum (Al), silver (Ag), aluminum-lithium (Al—Li), calcium (Ca), magnesium-indium (Mg—In), and magnesium-silver (Mg—Ag). In some embodiments, ITO or IZO may be used to form a transmissive second electrode 19 to manufacture a top emission light-emitting device. In some embodiments, the material for forming the second electrode 19 may vary.

Hereinbefore the organic light-emitting device has been described with reference to FIG. 2, but embodiments are not limited thereto.

According to an aspect of another embodiment, an electronic apparatus may include the light-emitting device. Thus, an electronic apparatus including the light-emitting device may be provided. The electronic apparatus may include, for example, a display, lighting, a sensor, or the like.

The term "$C_1$-$C_{60}$ alkyl group" as used herein refers to a linear or branched saturated aliphatic hydrocarbon monovalent group having 1 to 60 carbon atoms, and the term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof. In some embodiments, Formula 9-33 may be a branched $C_6$ alkyl group. Formula 9-33 may be a tert-butyl group substituted with two methyl groups.

The term "$C_1$-$C_{60}$ alkoxy group" as used herein refers to a monovalent group represented by $—OA_{101}$ (wherein $A_{101}$ is a $C_1$-$C_{60}$ alkyl group). Examples thereof include a methoxy group, an ethoxy group, a propoxy group, a butoxy group, and a pentoxy group.

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, and a bicyclo[2.2.2]octyl group.

The term "$C_1$-$C_{10}$ heterocycloalkyl group" as used herein refers to a monovalent cyclic group having 1 to 10 carbon atoms and at least one heteroatom of N, O, P, Si, S, Se, Ge, and B as a ring-forming atom. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group as used herein may include a silolanyl group, a silinanyl group, a tetrahydrofuranyl group, a tetrahydro-2H-pyranyl group, or a tetrahydrothiophenyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group including at least one heteroatom of N, O, P, Si, S, Se, Ge, and B as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other.

The term "$C_7$-$C_{60}$ alkyl aryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a heterocyclic aromatic system having at least one heteroatom of N, O, P, Si, S, Se, Ge, and B as a ring-forming atom and 1 to 60 carbon atoms. The term "$C_1$-$C_{60}$ heteroarylene group" as used herein refers to a divalent group having a heterocyclic aromatic system having at least one heteroatom of N, O, P, Si, S, Se, Ge and B as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein is represented by $—OA_{102}$ (wherein $A_{102}$ is the $C_6$-$C_{60}$ aryl group). The term "$C_6$-$C_{60}$ arylthio group" as used herein is represented by $—SA_{103}$ (wherein $A_{103}$ is the $C_6$-$C_{60}$ aryl group). The term "$C_1$-$C_{60}$ alkylthio group" as used herein is represented by $—SA_{104}$ (wherein $A_{104}$ is the $C_1$-$C_{60}$ alkyl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom selected from N, O, P, Si, S, Se, Ge, and B and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" may include an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, or a fluorene group, (each unsubstituted or substituted with at least one $R_{10a}$).

The term "$C_1$-$C_{30}$ heterocyclic group" as used herein refers to saturated or unsaturated cyclic group including 1 to 30 carbon atoms and at least one heteroatom selected from N, O, P, Si, S, Se, Ge, and B as ring-forming atoms. The $C_1$-$C_{30}$ heterocyclic group may be a monocyclic group or a polycyclic group. Examples of the "$C_1$-$C_{30}$ heterocyclic group (unsubstituted or substituted with at least one $R_{10a}$)" may include a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, (each unsubstituted or substituted with at least one $R_{10a}$).

Examples of the "$C_5$-$C_{30}$ carbocyclic group" and the "$C_1$-$C_{30}$ heterocyclic group" as used herein include i) a third ring, ii) a fourth ring, iii) a condensed ring in which at least two third rings are condensed, iv) a condensed ring in which at least two fourth rings are condensed, or v) a condensed ring in which at least one third ring and at least one fourth ring are condensed, the third ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the fourth ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{10}$ heterocycloalkyl group", and "fluorinated phenyl group" as used herein may respectively be a $C_1$-$C_{60}$ alkyl group (or $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F).

Examples of the "fluorinated $C_1$ alkyl group (i.e., a fluorinated methyl group)" may include $—CF_3$, $—CF_2H$, and $—CFH_2$. The "fluorinated $C_1$-$C_{60}$ alkyl group (or fluorinated $C_{20}$ alkyl group or the like)", "fluorinated $C_3$-$C_{10}$ cycloalkyl group", "fluorinated $C_1$-$C_{10}$ heterocycloalkyl group", or "fluorinated phenyl group" may respectively be: i) a fully fluorinated $C_1$-$C_{60}$ alkyl group (or fully fluorinated $C_1$-$C_{20}$ alkyl group or the like), fully fluorinated $C_3$-$C_{10}$ cycloalkyl group, fully fluorinated $C_1$-$C_{10}$ heterocycloalkyl group, or fully fluorinated phenyl group, in which all hydrogen atoms are substituted with fluoro groups; or ii) a partially fluorinated $C_1$-$C_{60}$ alkyl group (or partially fluorinated $C_1$-$C_{20}$ alkyl group or the like), partially fluorinated $C_3$-$C_{10}$ cycloalkyl group, partially fluorinated heterocycloalkyl group, or partially fluorinated phenyl group, in which some of hydrogen atoms are substituted with fluoro groups.

The "deuterated $C_1$-$C_{60}$ alkyl group (or deuterated $C_1$-$C_{20}$ alkyl group or the like)", "deuterated $C_3$-$C_{10}$ cycloalkyl group", "deuterated heterocycloalkyl group", and "deuterated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one deuterium. Examples of the "deuterated $C_1$ alkyl group (i.e., a deuterated methyl group)" may include —$CD_3$, —$CD_2H$, and —$CDH_2$. Examples of the "deuterated $C_3$-$C_{10}$ cycloalkyl group" may include Formula 10-501. The "deuterated $C_1$-$C_{60}$ alkyl group (or deuterated $C_1$-$C_{20}$ alkyl group or the like)", "deuterated $C_3$-$C_{10}$ cycloalkyl group", "deuterated heterocycloalkyl group", or deuterated phenyl group may respectively be: i) a fully deuterated $C_1$-$C_{60}$ alkyl group (or fully deuterated $C_1$-$C_{20}$ alkyl group or the like), fully deuterated $C_3$-$C_{10}$ cycloalkyl group, fully deuterated heterocycloalkyl group, or fully deuterated phenyl group, in which all hydrogen atoms are substituted with deuterium atoms; or ii) a partially deuterated $C_1$-$C_{60}$ alkyl group (or partially deuterated $C_1$-$C_{20}$ alkyl group or the like), partially deuterated $C_3$-$C_{10}$ cycloalkyl group, partially deuterated heterocycloalkyl group, or partially deuterated phenyl group, in which some of hydrogen atoms are substituted with deuterium atoms.

The "($C_1$-$C_{20}$ alkyl)'X' group" refers to a 'X' group substituted with at least one $C_1$-$C_{20}$ alkyl group. For example, The "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the "($C_1$-$C_{20}$ alkyl)phenyl group" as used herein refers to a phenyl group substituted with at least one $C_1$-$C_{20}$ alkyl group. Examples of the ($C_1$ alkyl)phenyl group may include a toluyl group.

As used herein, the number of carbons in each group that is substituted (e.g., $C_1$-$C_{60}$) excludes the number of carbons in the substituent. For example, a $C_1$-$C_{60}$ alkyl group can be substituted with a $C_1$-$C_{60}$ alkyl group. The total number of carbons included in the $C_1$-$C_{60}$ alkyl group substituted with the $C_1$-$C_{60}$ alkyl group is not limited to 60 carbons. In addition, more than one $C_1$-$C_{60}$ alkyl substituent may be present on the $C_1$-$C_{60}$ alkyl group. This definition is not limited to the $C_1$-$C_{60}$ alkyl group and applies to all substituted groups that recite a carbon range.

In the present specification, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" each refer to a hetero ring in which at least one ring-forming carbon atom is substituted with nitrogen atom and respectively having an identical backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group".

Substituents of the substituted $C_5$-$C_{30}$ carbocyclic group, the substituted $C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group; a $C_1$-$C_{60}$ alkyl group, a $C_2$-$C_{60}$ alkenyl group, a $C_2$-$C_{60}$ alkynyl group, a $C_1$-$C_{60}$ alkoxy group, or $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a Coo alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —B($Q_{36}$)($Q_{37}$), —P(=O)($Q_{38}$)($Q_{39}$), or —P($Q_{38}$) ($Q_{39}$), or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$, and $Q_{31}$ to $Q_{39}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$, or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an amount of B used was identical to an amount of A used based on molar equivalence.

EXAMPLES

Evaluation Example 1

Manufacture of TOF(E1-62)

Compound E1-62 was deposited on an ITO electrode to form a film containing Compound E1-62 and having a thickness of 1 μm. Then, Al was deposited on the film containing Compound E1-62 to form an Al electrode having a thickness of 800 nm, thereby completing the manufacture of TOF(E1-62), which is a time of flight (TOF) device, having a structure of ITO electrode/film containing Compound E1-62 (1 μm)/Al electrode (800 nm).

Manufacture of TOF(E1-63)

TOF(E1-63), which is a TOF device, having a structure of ITO electrode/film containing Compound E1-63 (1 μm)/Al electrode (800 nm), was manufactured in the same manner as in Manufacture of TOF(E1-62), except that Compound E1-63 was used instead of Compound E1-62.

Measurement of Electron Mobility of Compound E1-62

Figure 3:
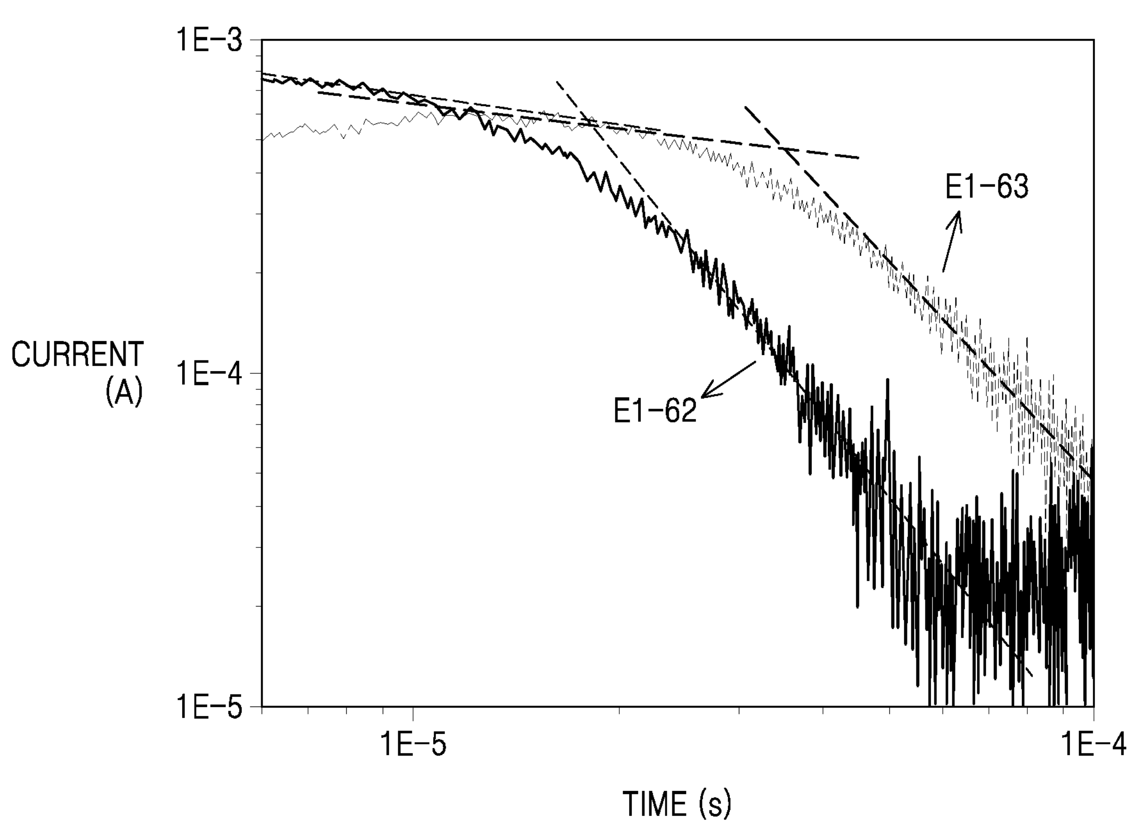
FIG. 3 is a graph of time versus current graph of TOF (E1-62) and TOF (E1-63).

A voltage of 20 V was applied to TOF(E1-62) by using a voltage source (Keithley 2410 Sourcemeter), and TOF(E1-62) was irradiated with laser light having a wavelength of 337 nm by $N_2$ laser (Optical Building Blocks Corporation, 337 nm, a pulse width: 1 nanosecond (ns)). The time versus current graph of TOF(E1-62) was measured. The results thereof are shown in FIG. 3. Subsequently, the electron mobility of Compound E1-62 was evaluated by using the time versus current graph of TOF(E1-62) in FIG. 3 and Equation 100. The results thereof are shown in Table 1. That is, the electron mobility ($cm^2$/Vs) of Compound E1-62 was calculated by i) substituting "d" in Equation 100 with 1 μm, ii) substituting "t" in Equation 100 with the time corresponding to the intersection point of two tangent lines (see dotted line in FIG. 3) in the time versus current graph (a log-log scale) of TOF(E1-62) in FIG. 3, and iii) substituting "V" in Equation 100 with 20 V (field strength $F=2\times10^5$V/cm).

Measurement of Electron Mobility of Compound E1-63

The time versus current graph of TOF(E1-63) was measured in the same manner described above and shown in FIG. 3. The electron mobility of Compound E1-63 was calculated by using the time versus current graph of TOF (E1-63) shown in FIG. 3 and Equation 100. The results thereof are shown in Table 1.

TABLE 1

| Compound | Electron mobility ($cm^2$/Vs) |
|---|---|
| E1-62 | $2.8 \times 10^{-5}$ |
| E1-63 | $1.4 \times 10^{-5}$ |

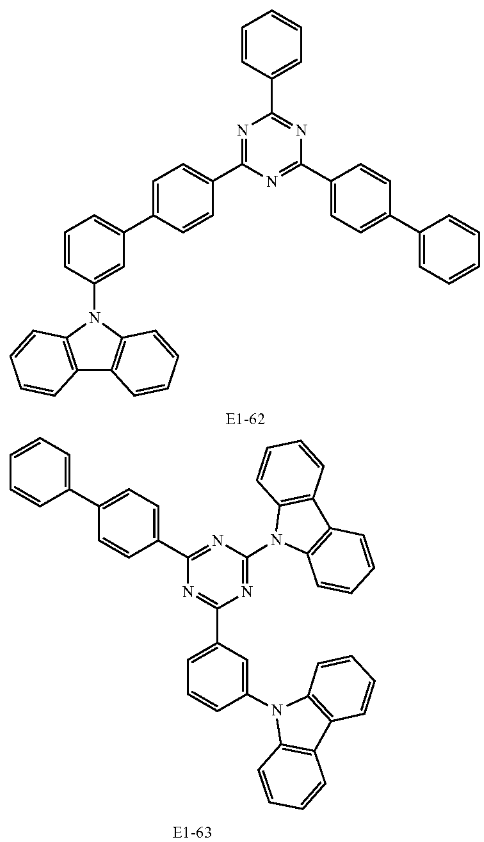

E1-62

E1-63

Referring to the results of Table 1, the electron mobility of Compound E1-62 was found to be greater than the electron mobility of Compound E1-63.

Synthesis Example 1 (D-Ir(1))

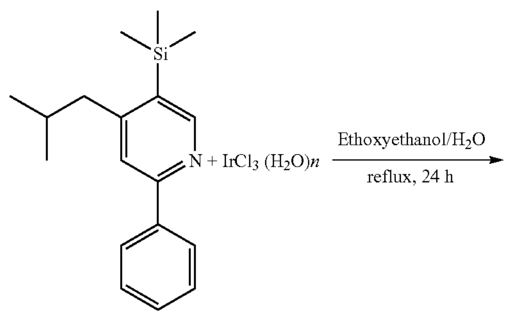

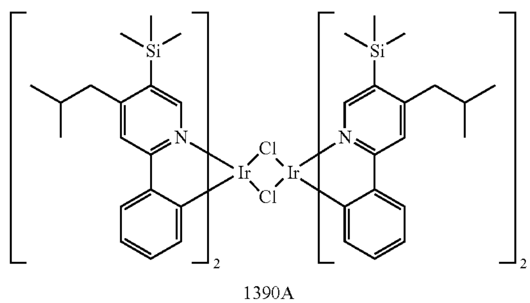

1390A

+

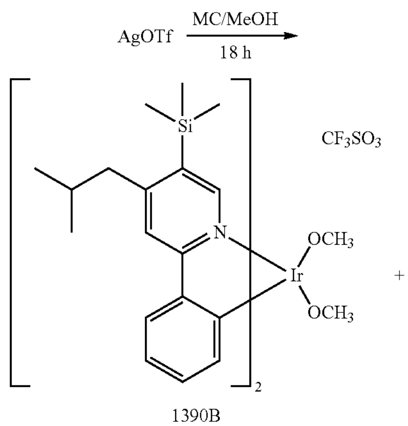

1390B

+

-continued

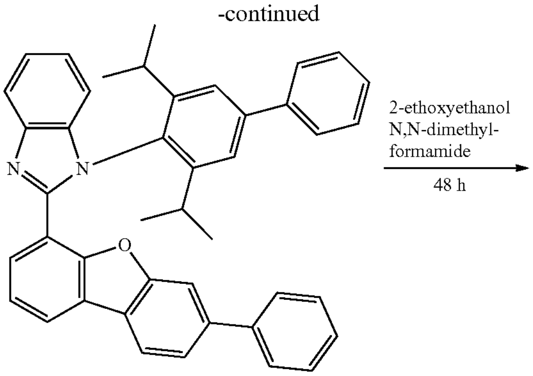

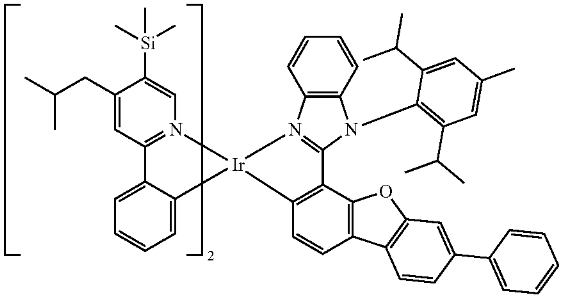

D-Ir(1)

Synthesis of Compound 1390A 33.1 millimole (mmol) of 4-isobutyl-2-phenyl-5-(trimethylsilyl)pyridine and 5.2 grams (g) (14.7 mmol) of iridium chloride ($IrCl_3(H_2O)_n$, n=3) were mixed with 120 milliliters (mL) of ethoxyethanol and 40 mL of distilled water. Then, the mixture was stirred under reflux for 24 hours, and then the temperature was dropped to room temperature. A solid formed therefrom was separated by filtration. The solid was washed sufficiently with water, methanol, and hexane in the stated order and dried in a vacuum oven to thereby obtain 7.4 g of Compound 1390A (yield: 74%).

Synthesis of Compound 1390B 1.2 mmol of Compound 1390A was mixed with 45 mL of methylene chloride (MC), and a solution, in which 0.6 g (2.3 mmol) of AgOTf was dissolved in 15 mL of methanol (MeOH), was added thereto. Then, the mixture was stirred for 18 hours at room temperature while blocking light by using an aluminum foil. The resulting mixture was celite-filtered to remove a solid formed therefrom and the filtrate was concentrated under reduced pressure to thereby obtain a solid (Compound 1390B). The solid was used in the following reaction without any further purification.

Synthesis of D-Ir(1) (Compound 1390 of Group 1-3)

2.3 mmol of Compound 1390B and 2.8 mmol of 1-(3,5-diisopropyl-[1,1'-biphenyl]-4-yl)-2-(7-phenyldibenzo[b,d]furan-4-yl)-1H-benzo[d]imidazole were mixed with 50 mL of 2-ethoxyethanol and 50 mL of N,N-dimethylformamide, followed by stirring under reflux for 48 hours. Then, the temperature was lowered to room temperature. The thus obtained mixture was concentrated under reduced pressure to obtain a solid which then was subjected to column chromatography (eluent: methylene chloride (MC) and hexane) to thereby obtain 0.56 g of D-Ir(1) (Compound 1390 of Group 1-3) (yield: 39%). The resulting compound was identified by using mass spectroscopy and HPLC analysis.

HRMS (MALDI) calcd. for $C_{79}H_{83}IrN_4OSi_2$: m/z 1352.5735. Found: 1352.5733.

Example 1

A glass substrate, on which an anode having an ITO/Ag/ITO (70 Å/1,000 Å/70 Å) structure was deposited, was cut to a size of 50 millimeters (mm)×50 mm×0.5 mm, sonicated in isopropyl alcohol and water for 5 minutes each, and cleaned by exposure to ultraviolet rays and ozone for 30 minutes. Subsequently, the glass substrate was mounted on a vacuum-deposition device.

Compound HT3 and Compound F6-TCNNQ were co-vacuum-deposited on the anode at a weight ratio of 98:2 to form a hole injection layer having a thickness of 10 nm and Compound HT3 was then vacuum-deposited on the hole injection layer to form a hole transport layer having a thickness of 155 nm. Compound HT(1) was vacuum-deposited on the hole transport layer to form an electron blocking layer having a thickness of 30 nm.

Subsequently, $Ir(ppy)_3$ as a first dopant and a first hole-transporting compound (HT(1)) and a first electron-transporting compound (E1-63) as hosts were co-deposited on the electron blocking layer to form a first emission layer having a thickness of 10 nm and $Ir(ppy)_3$ as a second dopant and the second hole-transporting compound (HT(1)) and the second electron-transporting compound (E1-62) as hosts were co-deposited on the first emission layer to form a second emission layer having a thickness of 23 nm, thereby forming an emission layer. A content of the first dopant in the first emission layer was 7 parts by weight based on 100 parts by weight of the first emission layer. A weight ratio of the first hole-transporting compound to the first electron-transporting compound in the first emission layer was 6:4 as shown in Table 2 (see the weight ratio in the parenthesis in Table 2). A content of the second dopant in the second emission layer was 7 parts by weight based on 100 parts by weight of the second emission layer. A weight ratio of the second hole-transporting compound to the second electron-transporting compound in the second emission layer was 6.5:3.5 as shown in Table 2.

Compound ET3 and Compound ET-D1 were co-deposited at a volume ratio of 50:50 on the emission layer to form an electron transport layer having a thickness of 35 nm, LiF was deposited on the electron transport layer to form an electron injection layer having a thickness of 1 nm, and Mg and Ag were co-deposited at a weight ratio of 90:10 on the electron injection layer to form a cathode having a thickness of 12 nm, thereby completing the manufacture of an organic light-emitting device. Compound HT(1) was identical to Compound H1-8 of Group 5-2 provided herein.

HT3

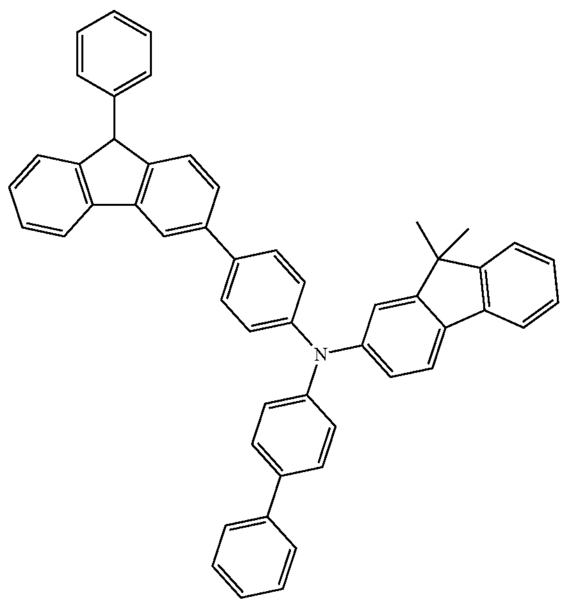

F6-TCNNQ

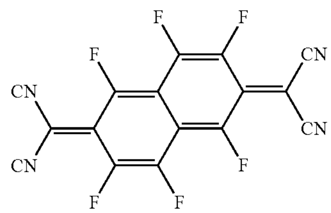

ET3

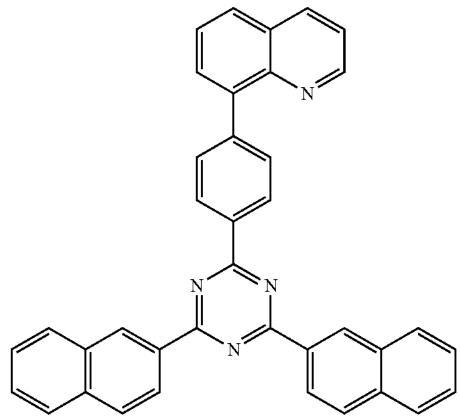

ET-D1

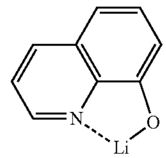

Examples 2 to 4 and Comparative Examples 1 to 4

Organic light-emitting devices were each manufactured in the same manner as in Example 1, except that an emission layer was formed as shown in Table 2 (Comparative Example 1 did not include a second emission layer, and Comparative Example 2 did not include a first emission layer.)

TABLE 2

| | First emission layer | | | Second emission layer | | |
|---|---|---|---|---|---|---|
| | Host | First dopant | Thickness (nm) | Host | Second dopant | Thickness (nm) |
| Example 1 | HT(1) E1-63 (6:4) | $Ir(ppy)_3$ | 10 | HT(1) E1-62 (6.5:3.5) | $Ir(ppy)_3$ | 23 |
| Example 2 | HT(1) E1-63 (6:4) | $Ir(ppy)_3$ | 15 | HT(1) E1-62 (6.5:3.5) | $Ir(ppy)_3$ | 18 |
| Example 3 | HT(1) E1-63 (6:4) | $Ir(ppy)_3$ | 20 | HT(1) E1-62 (6.5:3.5) | $Ir(ppy)_3$ | 13 |
| Example 4 | HT(1) E1-63 (6:4) | $Ir(ppy)_3$ | 10 | HT(1) E1-62 (5.5:4.5) | $Ir(ppy)_3$ | 23 |
| Comparative Example 1 | HT(1) E1-63 (6:4) | $Ir(ppy)_3$ | 33 | | — | |
| Comparative Example 2 | | — | | HT(1) E1-62 (6.5:3.5) | $Ir(ppy)_3$ | 33 |
| Comparative Example 3 | HT(1) E1-62 (6:4) | $Ir(ppy)_3$ | 10 | HT(1) E1-63 (6.5:3.5) | $Ir(ppy)_3$ | 23 |
| Comparative Example 4 | HT(1) E1-63 (6:4) | $Ir(ppy)_3$ | 10 | E1-63 E1-62 (6.5:3.5) | $Ir(ppy)_3$ | 23 |

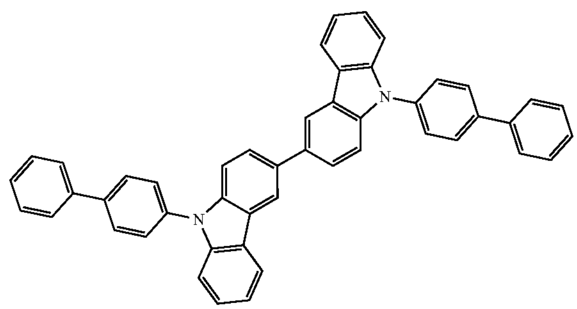

HT(1)

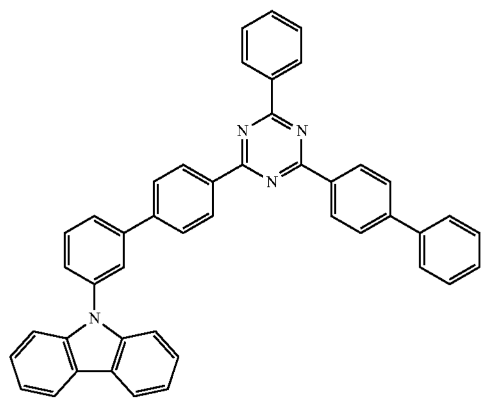

E1-62

TABLE 2-continued

| | First emission layer | | | Second emission layer | | |
|---|---|---|---|---|---|---|
| | Host | First dopant | Thickness (nm) | Host | Second dopant | Thickness (nm) |

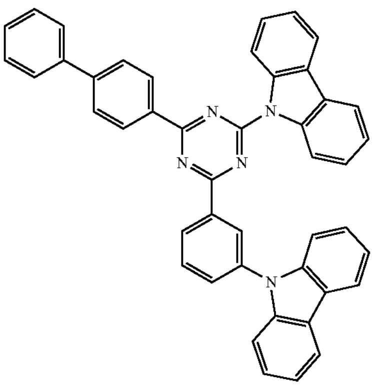

E1-63

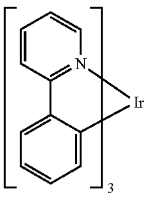

Ir(ppy)$_3$

Examples 11 to 14

Organic light-emitting devices were each manufactured in the same manner as in Example 1, except that an emission layer was formed as shown in Table 3.

TABLE 3

| | First emission layer | | | Second emission layer | | |
|---|---|---|---|---|---|---|
| | Host | First dopant | Thickness (nm) | Host | Second dopant | Thickness (nm) |
| Example 11 | HT(1) E1-63 (6:4) | D-Ir(1) | 10 | HT(1) E1-62 (6.5:3.5) | D-Ir(1) | 23 |
| Example 12 | HT(1) E1-63 (6:4) | D-Ir(1) | 15 | HT(1) E1-62 (6.5:3.5) | D-Ir(1) | 18 |
| Example 13 | HT(1) E1-63 (6:4) | D-Ir(1) | 20 | HT(1) E1-62 (6.5:3.5) | D-Ir(1) | 13 |
| Example 14 | HT(1) E1-63 (6:4) | D-Ir(1) | 10 | HT(1) E1-62 (5.5:4.5) | D-Ir(1) | 23 |

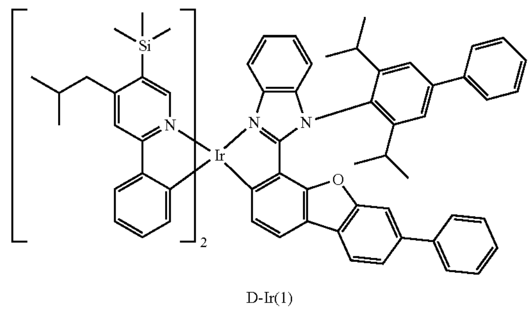

D-Ir(1)

Evaluation Example 2

The driving voltage (V) (at 15,000 nit), luminescence efficiency versus current density (cd/A) (at 15,000 nit), luminescence efficiency versus power (cd/W) (at 15,000 nit), and lifespan (hours) (at 30,000 nit) of the organic light-emitting devices manufactured in Examples 1 to 4 and 11 to 14 and Comparative Examples 1 to 4 were evaluated. The results thereof are shown in Table 4. A Keithley 2400 current voltmeter and a luminance meter (Minolta Cs-1000A) were used in the evaluation. The lifespan ($LT_{97}$) refers to time (hours) required for the initial luminance of the organic light-emitting device to reduce to 97% thereof. The luminescence efficiency versus current density, luminescence efficiency versus power, and lifespan ($LT_{97}$) shown in Table 4 are each shown in relative values (%).

TABLE 4

| | Driving voltage (V) | Luminescence efficiency versus current density (at driving voltage) (relative value, %) | Luminescence efficiency versus power (at driving voltage) (relative value, %) | Lifespan ($LT_{97}$) (relative value, %) |
|---|---|---|---|---|
| Example 1 | 3.8 | 72 | 20 | 18 |
| Example 2 | 3.8 | 72 | 20 | 19 |
| Example 3 | 3.9 | 73 | 20 | 19 |
| Example 4 | 3.8 | 72 | 21 | 17 |
| Comparative Example 1 | 4.3 | 64 | 16 | 17 |
| Comparative Example 2 | 3.9 | 71 | 20 | 14 |
| Comparative Example 3 | 4.1 | 64 | 17 | 5 |
| Comparative Example 4 | 3.6 | 67 | 20 | 1 |
| Example 11 | 3.4 | 100 | 99 | 93 |
| Example 12 | 3.4 | 100 | 99 | 94 |
| Example 13 | 3.4 | 99 | 100 | 100 |
| Example 14 | 3.3 | 98 | 100 | 84 |

Referring to the results of Table 4, the organic light-emitting devices of Examples 1 to 4 and 11 to 14 were found to have improved driving voltage, luminescence efficiency (luminescence efficiency versus current density and luminescence efficiency versus power), and/or lifespan, as compared with the organic light-emitting devices of Comparative Examples 1 to 4.

As apparent from the foregoing description, the light-emitting device may have excellent driving voltage, excellent luminescence efficiency, and/or excellent lifespan characteristics, and thus, a high-quality electronic apparatus may be manufactured by using the light-emitting device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:

a first electrode;

a second electrode facing the first electrode; and an emission layer between the first electrode and the second electrode, wherein the emission layer comprises: i) a first emission layer and ii) a second emission layer between the first emission layer and the second electrode, the first emission layer is in direct contact with the second emission layer, the first emission layer comprises a first dopant, a first hole-transporting compound, and a first electron-transporting compound, the second emission layer comprises a second dopant, a second hole-transporting compound, and a second electron-transporting compound, the first dopant is identical to the second dopant, the first electron-transporting compound is different from the second electron-transporting compound, the first electron-transporting compound is a compound represented by Formula 7S and the second electron-transporting compound is a compound represented by Formula 7F,

7S

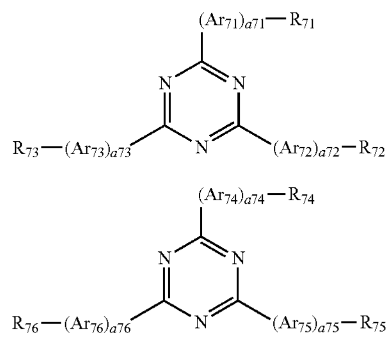

7F wherein, in Formulae 7S and 7F, $Ar_{71}$ to $Ar_{76}$ are each independently a benzene group or a carbazole group, each unsubstituted or substituted with deuterium, a $C_1$-$C_{20}$ alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl) biphenyl group, or any combination thereof, a71 to a76 may each independently be 1, 2, or 3, $R_{71}$ to $R_{76}$ may each independently be hydrogen, deuterium, a $C_1$-$C_{20}$_alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl) biphenyl group, a carbazolyl group, a deuterated carbazolyl group, a ($C_1$-$C_{20}$ alkyl) carbazolyl group, a di($C_1$-$C_{20}$ alkyl) carbazolyl group, or a (phenyl) carbazolyl group, an electron mobility of the second electron-transporting compound is greater than an electron mobility of the first electron-transporting compound, and the electron mobility of the first electron-transporting compound and the electron mobility of the second electron-transporting compound are respectively evaluated by using a time versus current graph of a time of flight (TOF) device comprising the first electron-transporting compound or the second electron-transporting compound, wherein Equation 3 is satisfied:

Con(ET2)>Con(ET1) Equation 3 wherein, in Equation 3,

Con (ET2) indicates the parts by weight of the second electron-transporting compound, based on 100 parts by weight of the total weight of the second dopant, the second hole-transporting compound, and the second electron-transporting compound, and Con (ET1) indicates the parts by weight of the first electron-transporting compound, based on 100 parts by weight of the total weight of the first dopant, the first hole-transporting compound, and the first electron-transporting compound.

2. The light-emitting device of claim 1, wherein the first emission layer comprises a mixture comprising the first dopant, the first hole-transporting compound, and the first electron-transporting compound, and the second emission layer comprises a mixture comprising the second dopant, the second hole-transporting compound, and the second electron-transporting compound.

3. The light-emitting device of claim 1, wherein the first hole-transporting compound and the second hole-transporting compound are each a compound i) comprising at least one π electron-rich $C_3$-$C_{60}$ cyclic group and ii) not including an electron-transporting group.

4. The light-emitting device of claim 1, wherein the electron mobility of the second electron-transporting compound is 110 percent (%) or greater of the electron mobility of the first electron-transporting compound.

5. The light-emitting device of claim 1, wherein the electron mobility of the second electron-transporting compound is in a range of about 110% to about 300% of the electron mobility of the first electron-transporting compound.

6. The light-emitting device of claim 1, wherein the electron mobility of the second electron-transporting compound is $2.0\times10^{-5}$ $cm^2/Vs$ or greater, and the electron mobility of the first electron-transporting compound is less than $2.8\times10^{-5}$ $cm^2/Vs$.

7. The light-emitting device of claim 1, wherein Equation 1 is satisfied:

Con(HT1)>Con(ET1) Equation 1 wherein, in Equation 1,

Con(HT1) indicates the parts by weight of the first hole-transporting compound, based on 100 parts by weight of the total weight of the first dopant, the first hole-transporting compound, and the first electron-transporting compound, and Con (ET1) indicates the parts by weight of the first electron-transporting compound, based on 100 parts by weight of the total weight of the first dopant, the first hole-transporting compound, and the first electron-transporting compound.

8. The light-emitting device of claim 7, wherein a ratio of Con(HT1) to Con (ET1) is in a range of about 8:2 to about 5.2:4.8.

9. The light-emitting device of claim 1, wherein Equation 2 is satisfied:

Con(HT2)>Con(ET2) Equation 2 wherein, in Equation 2,

Con(HT2) indicates the parts by weight of the second hole-transporting compound, based on 100 parts by weight of the total weight of the second dopant, the second hole-transporting compound, and the second electron-transporting compound, and Con (ET2) indicates the parts by weight of the second electron-transporting compound, based on 100 parts by weight of the total weight of the second dopant, the second hole-transporting compound, and the second electron-transporting compound.

10. The light-emitting device of claim 9, wherein a ratio of Con(HT2) to Con (ET2) is in a range of about 8:2 to about 5.2:4.8.

11. A light-emitting device comprising:

a first electrode;

a second electrode facing the first electrode; and an emission layer between the first electrode and the second electrode, wherein the emission layer comprises: i) a first emission layer and ii) a second emission layer between the first emission layer and the second electrode, the first emission layer is in direct contact with the second emission layer, the first emission layer comprises a first dopant, a first hole-transporting compound, and a first electron-transporting compound, the second emission layer comprises a second dopant, a second hole-transporting compound, and a second electron-transporting compound, the first dopant is identical to the second dopant, the first electron-transporting compound is different from the second electron-transporting compound, the first electron-transporting compound is a compound represented by Formula 7S and the second electron-transporting compound is a compound represented by Formula 7F,

7S

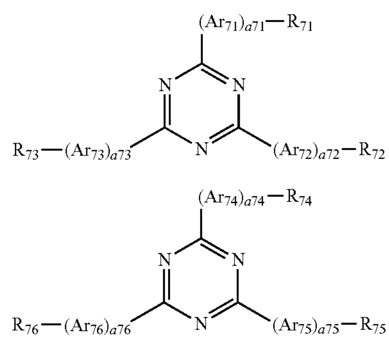

7F wherein, in Formulae 7S and 7F, $Ar_{71}$ to $Ar_{76}$ are each independently a benzene group or a carbazole group, each unsubstituted or substituted with deuterium, a $C_1$-$C_{20}$ alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl) biphenyl group, or any combination thereof, a71 to a76 may each independently be 1, 2, or 3, $R_{71}$ to $R_{76}$ may each independently be hydrogen, deuterium, a $C_1$-$C_{20}$ alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl) biphenyl group, a carbazolyl group, a deuterated carbazolyl group, a ($C_1$-$C_{20}$ alkyl) carbazolyl group, a di($C_1$-$C_{20}$ alkyl) carbazolyl group, or a (phenyl) carbazolyl group, an electron mobility of the second electron-transporting compound is greater than an electron mobility of the first electron-transporting compound, and the electron mobility of the first electron-transporting compound and the electron mobility of the second electron-transporting compound are respectively evaluated by using a time versus current graph of a time of flight (TOF) device comprising the first electron-transporting compound or the second electron-transporting compound, wherein Equation 4 is satisfied:

$$Con(ET2) < Con(ET1) \quad \text{Equation 4}$$

wherein, in Equation 4,

Con (ET2) indicates the parts by weight of the second electron-transporting compound, based on 100 parts by weight of the total weight of the second dopant, the second hole-transporting compound, and the second electron-transporting compound, and Con (ET1) indicates the parts by weight of the first electron-transporting compound, based on 100 parts by weight of the total weight of the first dopant, the first hole-transporting compound, and the first electron-transporting compound.

12. The light-emitting device of claim 1, wherein a ratio of a thickness of the second emission layer to a thickness of the first emission layer is in a range of about 9:1 to about 1:9.

13. The light-emitting device of claim 1, wherein light which is emitted from the emission layer and passes through at least one of the first electrode and the second electrode to the outside of the device is not white light.

14. The light-emitting device of claim 1, wherein light which is emitted from the emission layer and passes through at least one of the first electrode and the second electrode to the outside of the device is green light having a maximum emission wavelength in a range of about 500 nanometers (nm) to about 580 nm.

15. The light-emitting device of claim 1, further comprising a hole transport region between the first electrode and the emission layer, wherein the hole transport region does not comprise a charge-generation layer and an emission layer.

16. The light-emitting device of claim 1, further comprising an electron transport region between the emission layer and the second electrode, wherein the electron transport region does not comprise a charge-generation layer and an emission layer.

17. An electronic apparatus comprising the light-emitting device of claim 1.

18. A light-emitting device comprising:

a first electrode;

a second electrode facing the first electrode; and an emission layer between the first electrode and the second electrode, wherein the emission layer comprises: i) a first emission layer and ii) a second emission layer between the first emission layer and the second electrode, the first emission layer is in direct contact with the second emission layer, the first emission layer comprises a first dopant, a first hole-transporting compound, and a first electron-transporting compound, the second emission layer comprises a second dopant, a second hole-transporting compound, and a second electron-transporting compound, the first dopant is identical to the second dopant, the first electron-transporting compound is different from the second electron-transporting compound, the first electron-transporting compound is a compound represented by Formula 7S and the second electron-transporting compound is a compound represented by Formula 7F,

7S

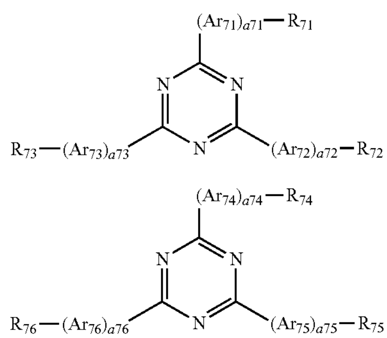

7F wherein, in Formulae 7S and 7F, $Ar_{71}$ to $Ar_{76}$ are each independently a benzene group or a carbazole group, each unsubstituted or substituted with deuterium, a $C_1$-$C_{20}$ alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl) biphenyl group, or any combination thereof, a71 to a76 may each independently be 1, 2, or 3, $R_{71}$ to $R_{76}$ may each independently be hydrogen, deuterium, a $C_1$-$C_{20}$ alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl) biphenyl group, a carbazolyl group, a deuterated carbazolyl group, a ($C_1$-$C_{20}$ alkyl) carbazolyl group, a di($C_1$-$C_{20}$ alkyl) carbazolyl group, or a (phenyl) carbazolyl group, an electron mobility of the second electron-transporting compound is greater than an electron mobility of the first electron-transporting compound, and the electron mobility of the first electron-transporting compound and the electron mobility of the second electron-transporting compound are respectively evaluated by using a time versus current graph of a time of flight (TOF) device comprising the first electron-transporting compound or the second electron-transporting compound, and the electron mobility is measured in the time of flight (TOF) device having a 1 um neat film of the respective compound between ITO and aluminum electrodes under a field strength of $2\times10^5$ V/cm.

* * * * *